US012522764B2

(12) United States Patent
Kim et al.

(10) Patent No.: US 12,522,764 B2
(45) Date of Patent: Jan. 13, 2026

(54) COMPOUND AND ORGANIC LIGHT EMITTING DEVICE COMPRISING SAME

(71) Applicant: LG CHEM, LTD., Seoul (KR)

(72) Inventors: Moung Gon Kim, Daejeon (KR); Wanpyo Hong, Daejeon (KR); Sujeong Geum, Daejeon (KR); Dong Hoon Lee, Daejeon (KR); Dongheon Kim, Daejeon (KR); Kyung Seok Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 969 days.

(21) Appl. No.: 17/426,080

(22) PCT Filed: Jul. 31, 2020

(86) PCT No.: PCT/KR2020/010130

§ 371 (c)(1),
(2) Date: Jul. 27, 2021

(87) PCT Pub. No.: WO2021/020931

PCT Pub. Date: Feb. 4, 2021

(65) Prior Publication Data

US 2023/0108169 A1 Apr. 6, 2023

(30) Foreign Application Priority Data

Jul. 31, 2019 (KR) ........................ 10-2019-0093187
Nov. 29, 2019 (KR) ........................ 10-2019-0156688
Nov. 29, 2019 (KR) ........................ 10-2019-0157398

(51) Int. Cl.

| | |
|---|---|
| ***H01L 51/00*** | (2006.01) |
| ***C07F 5/02*** | (2006.01) |
| ***C07F 7/08*** | (2006.01) |
| ***C09K 11/06*** | (2006.01) |
| ***H10K 85/30*** | (2023.01) |
| ***H10K 85/40*** | (2023.01) |
| ***H10K 85/60*** | (2023.01) |
| *H10K 50/11* | (2023.01) |
| *H10K 101/10* | (2023.01) |

(52) U.S. Cl.

CPC .............. *C09K 11/06* (2013.01); *C07F 5/027* (2013.01); *C07F 7/0816* (2013.01); *H10K 85/322* (2023.02); *H10K 85/40* (2023.02); *H10K 85/658* (2023.02); *C07B 2200/05* (2013.01); *C09K 2211/1018* (2013.01); *H10K 50/11* (2023.02); *H10K 2101/10* (2023.02)

(58) Field of Classification Search

None

See application file for complete search history.

(56) References Cited

U.S. PATENT DOCUMENTS

| | | | | |
|---|---|---|---|---|
| 9,634,254 | B2 | 4/2017 | Hamada | |
| 2015/0236274 | A1 | 8/2015 | Hatakeyama et al. | |
| 2017/0365787 | A1 | 12/2017 | Cha et al. | |
| 2018/0069182 | A1 | 3/2018 | Hatakeyama et al. | |
| 2019/0115538 | A1 | 4/2019 | Lim et al. | |
| 2019/0305227 | A1 | 10/2019 | Yoon | |
| 2020/0052212 | A1 | 2/2020 | Tasaki et al. | |
| 2020/0058885 | A1 | 2/2020 | Hong et al. | |
| 2020/0176679 | A1 | 6/2020 | Jeong et al. | |
| 2020/0185626 | A1 | 6/2020 | Yuuki | |
| 2021/0036233 | A1 | 2/2021 | Joo et al. | |
| 2021/0167293 | A1 * | 6/2021 | Joo | H10K 85/657 |
| 2021/0184121 | A1 | 6/2021 | Suh | |
| 2022/0006019 | A1 | 1/2022 | Kim et al. | |

FOREIGN PATENT DOCUMENTS

| | | | |
|---|---|---|---|
| CN | 107108048 | | 8/2017 |
| CN | 108336239 | | 7/2018 |
| JP | 2018-043984 | A | 3/2018 |
| KR | 10-2011-0126950 | A | 11/2011 |
| KR | 10-2015-0095545 | A | 8/2015 |
| KR | 10-2016-0119683 | A | 10/2016 |
| KR | 10-2018-0122298 | A | 11/2018 |

(Continued)

OTHER PUBLICATIONS

Office Action of Korean Patent Office in Appl'n No. 10-2020-0165167, dated Feb. 20, 2022.

Office Action of Korean Patent Office in Appl'n No. 10-2020-0165176, dated Feb. 27, 2022.

Office Action of Korean Patent Office in Appl'n No. 10-2020-0165179, dated Feb. 27, 2022.

Office Action of Korean Patent Office in Appl'n No. 10-2020-0165173, dated Feb. 20, 2022.

*Primary Examiner* — Jay Yang

(74) *Attorney, Agent, or Firm* — Bryan Cave Leighton Paisner LLP

(57) ABSTRACT

A compound represented by Formula 1 and an organic light emitting device including the same, and the compound providing improved efficiency and service life characteristics when the compound is applied to an organic material layer of the organic light emitting device.

[Formula 1]

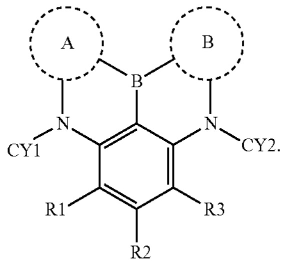

12 Claims, 1 Drawing Sheet

(56) References Cited

FOREIGN PATENT DOCUMENTS

| | | | | |
|---|---|---|---|---|
| KR | 10-2018-0127918 | A | | 11/2018 |
| KR | 10-2019-0042791 | A | | 4/2019 |
| KR | 10-1990818 | B1 | | 6/2019 |
| KR | 10-2019-0101900 | A | | 9/2019 |
| KR | 10-2019-0113498 | A | | 10/2019 |
| KR | 10-2148296 | | * | 8/2020 |
| KR | 10-2018-0112721 | A | | 10/2021 |

* cited by examiner

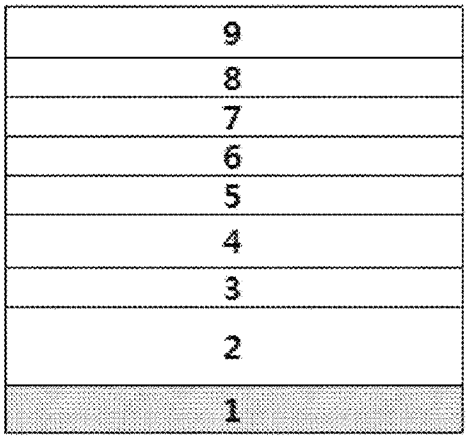
9
8
7
6
5
4
3
2
1

COMPOUND AND ORGANIC LIGHT EMITTING DEVICE COMPRISING SAME

CROSS-REFERENCE TO RELATED APPLICATION(S)

This application is a National Stage Application of International Application No. PCT/KR2020/010130 filed on Jul. 31, 2020, which claims priority to and benefit of Korean Patent Application Nos. 10-2019-0156688 and 10-2019-0157398 filed on Nov. 29, 2019, and Korean Patent Application No. 10-2019-0093187 filed on Jul. 31, 2019, the disclosures of which are incorporated herein by reference in their entireties for all purposes as if fully set forth herein.

TECHNICAL FIELD

The present specification relates to a compound and an organic light emitting device including the same.

BACKGROUND ART

In the present specification, an organic light emitting device is a light emitting device using an organic semiconductor material, and requires an exchange of holes and/or electrons between electrodes and organic semiconductor materials. The organic light emitting device may be roughly divided into the following two organic light emitting devices depending on the operation principle. The first organic light emitting device is a light emitting device in which an exciton is formed in an organic material layer by a photon that flows from an external light source to the device, the exciton is separated into electrons and holes, and the electrons and the holes are each transferred to different electrodes and used as a current source (voltage source). The second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, may be composed of a hole injection layer, a hole transport layer, a light emitting layer, an electron blocking layer, an electron transport layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state. Such an organic light emitting device has been known to have characteristics such as self-emission, high brightness, high efficiency, a low driving voltage, a wide viewing angle, and high contrast.

In an organic light emitting device, materials used as an organic material layer may be classified into a light emitting material and a charge transport material, for example, a hole injection material, a hole transport material, an electron blocking material, an electron transport material, an electron injection material, and the like depending on the function. The light emitting materials include blue, green, and red light emitting materials according to the light emitting color, and yellow and orange light emitting materials required for implementing a much better natural color.

Furthermore, a host/dopant system may be used as a light emitting material for the purpose of enhancing color purity and light emitting efficiency through energy transfer. The principle is that when a small amount of dopant which has a smaller energy band gap and better light emitting efficiency than those of a host mainly constituting a light emitting layer is mixed in the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the above-described excellent characteristics of the organic light emitting device, a material constituting an organic material layer in a device, for example, a hole injection material, a hole transport material, a light emitting material, an electron blocking material, an electron transport material, an electron injection material, and the like need to be supported by stable and efficient materials, so that there is a continuous need for developing a new material.

(Patent Document 1) Japanese Patent Application Laid-Open No. 2018-043984

DETAILED DESCRIPTION OF THE INVENTION

Technical Problem

The present specification describes a compound and an organic light emitting device including the same.

Technical Solution

An exemplary embodiment of the present specification provides a compound represented by the following Formula 1.

[Formula 1]

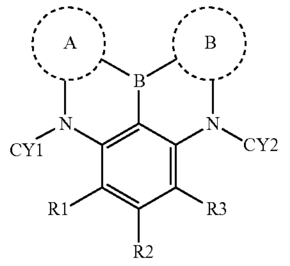

In Formula 1,

A and B are the same as or different from each other, and are each independently a substituted or unsubstituted hydrocarbon ring; or a substituted or unsubstituted hetero ring, and A and B may be bonded to each other to form a ring, CY1 and CY2 are the same as or different from each other, and are each independently a substituted or unsubstituted hydrocarbon ring group; or a substituted or unsubstituted heterocyclic group, R1 to R3 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or a group represented by the following Formula 2, one or more of the substituent group of A, the substituent group of B, and R1 to R3 is or are a group represented by the following Formula 2,

[Formula 2]

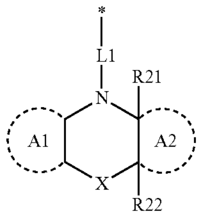

in Formula 2,

A1 is a substituted or unsubstituted aromatic hydrocarbon ring,

A2 is a substituted or unsubstituted alicyclic hydrocarbon ring,

X is a direct bond; or —CRR'—,

R, R', R21, and R22 are the same as or different from each other, and are each independently hydrogen; deuterium; a halogen group; a nitrile group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; or a substituted or unsubstituted heterocyclic group, L1 is a direct bond; a substituted or unsubstituted alkylene group; a substituted or unsubstituted arylene group; or a substituted or unsubstituted heteroarylene group, and

* means a position bonded to Formula 1.

Further, an exemplary embodiment of the present invention provides an organic light emitting device including: a first electrode; a second electrode; and an organic material layer having one or more layers provided between the first electrode and the second electrode, in which one or more layers of the organic material layer include the above-described compound.

Advantageous Effects

The compound of the present invention can be used as a material for an organic material layer of an organic light emitting device. The compound of the present invention has a low sublimation temperature and a narrow full width at half-maximum by including a structure of Formula 2 as a substituent, and can obtain an organic light emitting device having high efficiency, low voltage, and long service life characteristics when applied to the organic light emitting device.

BRIEF DESCRIPTION OF DRAWINGS

The FIGURE illustrates an organic light emitting device composed of a substrate 1, a positive electrode 2, a hole injection layer 3, a hole transport layer 4, an electron blocking layer 5, a light emitting layer 6, a first electron transport layer 7, a second electron transport layer 8, and a negative electrode 9.

EXPLANATION OF REFERENCE NUMERALS AND SYMBOLS

1: Substrate
2: Positive electrode
3: Hole injection layer
4: Hole transport layer
5: Electron blocking layer
6: Light emitting layer
7: First electron transport layer
8: Second electron transport layer
9: Negative electrode

BEST MODE

Hereinafter, the present specification will be described in more detail.

The present specification provides a compound represented by the following Formula 1. The compound represented by the following Formula 1 has a low sublimation temperature, and thus is stable, and the efficiency and service life characteristics of the organic light emitting device are improved when the compound is applied to an organic material layer of an organic light emitting device.

[Formula 1]

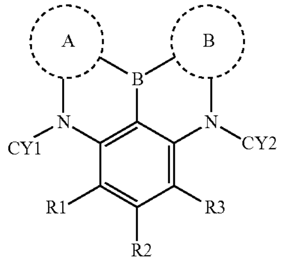

In Formula 1,

A and B are the same as or different from each other, and are each independently a substituted or unsubstituted hydrocarbon ring; or a substituted or unsubstituted hetero ring, and A and B may be bonded to each other to form a ring, CY1 and CY2 are the same as or different from each other, and are each independently a substituted or unsubstituted hydrocarbon ring group; or a substituted or unsubstituted heterocyclic group, R1 to R3 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or a group represented by the following Formula 2, one or more of the substituent group of A, the substituent group of B, and R1 to R3 are a group represented by the following Formula 2,

[Formula 2]

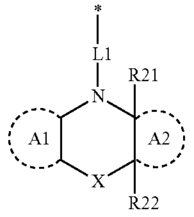

in Formula 2,

A1 is a substituted or unsubstituted aromatic hydrocarbon ring,

A2 is a substituted or unsubstituted alicyclic hydrocarbon ring,

X is a direct bond; or —CRR'—,

R, R', R21, and R22 are the same as or different from each other, and are each independently hydrogen; deuterium; a halogen group; a nitrile group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; or a substituted or unsubstituted heterocyclic group, L1 is a direct bond; a substituted or unsubstituted alkylene group; a substituted or unsubstituted arylene group; or a substituted or unsubstituted heteroarylene group, and

* means a position bonded to Formula 1.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of hydrogen; deuterium (—D); a halogen group; a nitrile group (—CN); a silyl group; a boron group; an alkyl group; an alkenyl group; an alkynyl group; a cycloalkyl group; an alkoxy group; an aryloxy group; an amine group; an aryl group; and a heterocyclic group, being substituted with a substituent to which two or more substituents among the substituents are linked, or having no substituent. For example, "the substituent to which two or more substituents are linked" may be a biphenyl group. That is, the biphenyl group may also be an aryl group, and may be interpreted as a substituent to which two phenyl groups are linked.

Further, in the present specification, the term "substituted or unsubstituted" means being substituted with one or two or more substituents selected from the group consisting of hydrogen; deuterium; a halogen group; a nitrile group; a silyl group having 1 to 30 carbon atoms; an alkyl group having 1 to 20 carbon atoms; a cycloalkyl group having 3 to 30 carbon atoms; an aryl group having 6 to 60 carbon atoms; a heterocyclic group having 2 to 60 carbon atoms, and a substituent to which two or more substituents among the substituents are linked, or having no substituent.

Examples of the substituents will be described below, but are not limited thereto.

In the present specification, examples of a halogen group include fluorine (F), chlorine (Cl), bromine (Br) or iodine (I).

In the present specification, a silyl group may be represented by a formula of —Si(Y101) (Y102) (Y103), and Y101, Y102, and Y103 may be each hydrogen; a substituted or unsubstituted alkyl group; a substituted or unsubstituted aryl group; or a substituted or unsubstituted heterocyclic group, but are not limited thereto. Examples of the silyl group include a trialkylsilyl group and a triarylsilyl group, and specific examples thereof include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenysilyl group, and the like, but the examples are not limited thereto.

In the present specification, a boron group may be represented by a formula of —B(Y104) (Y105), and Y104 and Y105 are each hydrogen; a substituted or unsubstituted alkyl group; a substituted or unsubstituted aryl group; and the like, and specific examples of the boron group include a trimethylboron group, a triethylboron group, a tert-butyldimethylboron group, a triphenylboron group, a phenylboron group, and the like, but are not limited thereto.

In the present specification, the alkyl group may be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, a propyl group, an isopropyl group, a butyl group, an isobutyl group, a tert-butyl group, a pentyl group, a hexyl group, a heptyl group, an octyl group, and the like, but are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, a decahydronaphthyl group (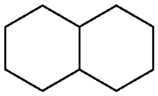), a tetradecahydroanthracenyl group ( 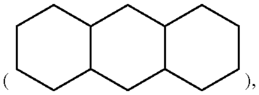 [SMILES: C1CCC2CC3CCCCC3CC2C1] ), a tetradecahydrophenanthrenyl group; an adamantyl group ( 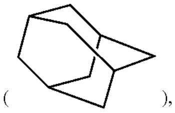 ), and the like, but are not limited thereto.

In the present specification, an amine group may be represented by a formula of —N(Y106) (Y107), and Y106 and Y107 are the same as or different from each other, and are each independently hydrogen; a substituted or unsubstituted alkyl group; a substituted or unsubstituted aryl group; or a substituted or unsubstituted heterocyclic group, but are not limited thereto.

In the present specification, an aryl group is not particularly limited, but has preferably 6 to 60 carbon atoms, and may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of the monocyclic aryl group include a phenyl group, a biphenyl group, a terphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, and the like, but are not limited thereto.

In the present specification, a fluorenyl group may be substituted, and two substituents may be bonded to each other to form a spiro structure.

When the fluorenyl group is substituted, the substituent may be a spirofluorenyl group such as

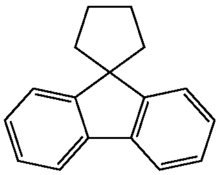 and 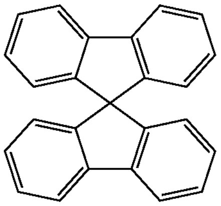 , and a substituted fluorenyl group such as

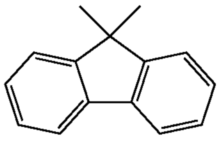

(a 9,9-dimethylfluorenyl group) and

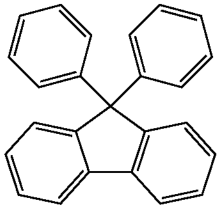 [SMILES: c1ccc(C2(c3ccccc3)c3ccccc3-c3ccccc32)cc1]

(a 9,9-diphenylfluorenyl group). However, the substituent is not limited thereto.

In the present specification, a heterocyclic group is a cyclic group including one or more of N, O, P, S, Si, SO, and Se as a heteroatom, and the number of carbon atoms thereof is not particularly limited, but is preferably 2 to 60. According to an exemplary embodiment, the number of carbon atoms of the heterocyclic group is 2 to 30. Examples of the heterocyclic group include a pyridine group, a pyrrole group, a pyrimidine group, a pyridazinyl group, a furan group, a thiophene group, an imidazole group, a pyrazole group, a dibenzofuran group, a dibenzothiophene group, a carbazole group, a dibenzothiophene oxide, and the like, but are not limited thereto.

In the present specification, the alkenyl group may be straight-chained or branched as a substituent including a double bond between a carbon atom and a carbon atom, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10. Specific examples thereof include vinyl, 1-propenyl, isopropenyl, 1-butenyl, 2-butenyl, 3-butenyl, 1-pentenyl, and the like, but are not limited thereto.

In the present specification, the alkynyl group may be straight-chained or branched as a substituent including a triple bond between a carbon atom and a carbon atom, and the number of carbon atoms thereof is not particularly limited, but is preferably 2 to 40. According to an exemplary embodiment, the number of carbon atoms of the alkenyl group is 2 to 20. According to another exemplary embodiment, the number of carbon atoms of the alkenyl group is 2 to 10.

In the present specification, the alkoxy group may be straight-chained, branched, or cyclic. The number of carbon atoms of the alkoxy group is not particularly limited, but is preferably 1 to 40. Specific examples thereof include methoxy, ethoxy, n-propoxy, isopropoxy, and the like, but are not limited thereto.

Substituents including an alkyl group, an alkoxy group, and other alkyl group moieties described in the present specification include both a straight-chained form and a branched form.

In the present specification, the above-described description on the aryl group may be applied to an aryl of an aryloxy group.

In the present specification, in a substituted or unsubstituted ring formed by bonding groups, the “ring” means a hydrocarbon ring; or a hetero ring.

The hydrocarbon ring may be an aromatic or alicyclic ring, and the aromatic hydrocarbon ring may be selected from the examples of the aryl group except for a divalent aromatic hydrocarbon ring.

In the present specification, the alicyclic hydrocarbon ring means a hydrocarbon ring except for an aromatic hydrocarbon ring, and the aliphatic hydrocarbon ring includes a ring including a double bond as in the following examples. The aliphatic hydrocarbon ring may be selected from the above-described examples of the cycloalkyl group except for a divalent aliphatic hydrocarbon ring, and examples of the alicyclic hydrocarbon ring include tetrahydronaphthalene ( 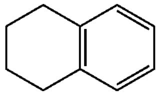 ), cyclopentene (  ), cyclohexene (  ), hydroindene ( 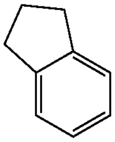 ), hydroanthracene ( 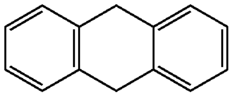 ), and the like, but are not limited thereto.

In the present specification, the description on the hydrocarbon ring may be applied to a hydrocarbon ring group except for a monovalent hydrocarbon ring.

In the present specification, the description on the aryl group may be applied to an aromatic hydrocarbon ring except for a divalent aromatic hydrocarbon ring.

The description on the heterocyclic group may be applied to the hetero ring except for a divalent hetero ring.

In the present specification, the above-described description on the alkyl group may be applied to an akylene group except for a divalent alkylene group.

In the present specification, the above-described description on the aryl group may be applied to an arylene group except for a divalent arylene group.

In the present specification, the above-described description on the heterocyclic group may be applied to a heteroarylene group except for a divalent and aromatic heteroarylene group.

In an exemplary embodiment of the present specification, in Formula 2, X is a direct bond; or —CRR'—.

When X is a direct bond, X may be represented as follows.

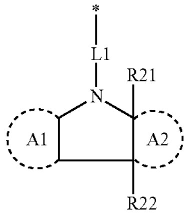

According to an exemplary embodiment of the present specification, R, R', R21, and R22 are the same as or different from each other, and are each independently hydrogen; deuterium; a halogen group; a nitrile group; a substituted or unsubstituted alkyl group having 1 to 60 carbon atoms; a substituted or unsubstituted alkenyl group having 2 to 60 carbon atoms; a substituted or unsubstituted alkynyl group having 2 to 60 carbon atoms; a substituted or unsubstituted alkoxy group having 1 to 60 carbon atoms; a substituted or unsubstituted aryloxy group having 6 to 60 carbon atoms; a substituted or unsubstituted cycloalkyl group having 3 to 60 carbon atoms; a substituted or unsubstituted aryl group having 6 to 60 carbon atoms; or a substituted or unsubstituted heterocyclic group having 2 to 60 carbon atoms.

According to another exemplary embodiment, R, R', R21, and R22 are the same as or different from each other, and are each independently hydrogen; deuterium; a halogen group; a nitrile group; a substituted or unsubstituted alkyl group having 1 to 30 carbon atoms; a substituted or unsubstituted alkenyl group having 2 to 30 carbon atoms; a substituted or unsubstituted alkynyl group having 2 to 30 carbon atoms; a substituted or unsubstituted alkoxy group having 1 to 30 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; or a substituted or unsubstituted heterocyclic group having 2 to 30 carbon atoms. The "substituted or unsubstituted" means being substituted with one or two or more substituents selected from the group consisting of hydrogen; deuterium; a halogen group; a nitrile group; a silyl group having 1 to 30 carbon atoms; an alkyl group having 1 to 20 carbon atoms; a cycloalkyl group having 3 to 30 carbon atoms; an aryl group having 6 to 60 carbon atoms; a heterocyclic group having 2 to 60 carbon atoms, and a substituent to which two or more substituents among the exemplified substituents are linked, or having no substituent.

According to still another exemplary embodiment, R, R', R21, and R22 are the same as or different from each other, and are each independently hydrogen; deuterium; an alkyl group having 1 to 30 carbon atoms; an aryl group having 6 to 30 carbon atoms; or a substituent to which two or more substituents among the exemplified substituents are linked.

According to yet another exemplary embodiment, R, R', R21, and R22 are the same as or different from each other, and are each independently hydrogen; a methyl group; —$CD_3$; a phenyl group; or a tert-phenyl group.

According to an exemplary embodiment of the present specification, L1 is a direct bond; a substituted or unsubstituted alkylene group having 1 to 60 carbon atoms; a substituted or unsubstituted arylene group having 6 to 60 carbon atoms; or a substituted or unsubstituted heteroarylene group having 2 to 60 carbon atoms.

According to another exemplary embodiment, L1 is a direct bond; a substituted or unsubstituted alkylene group having 1 to 30 carbon atoms; a substituted or unsubstituted arylene group having 6 to 30 carbon atoms; or a substituted or unsubstituted heteroarylene group having 2 to 30 carbon atoms.

In another exemplary embodiment, L1 is a direct bond.

In an exemplary embodiment of the present specification, CY1 and CY2 are the same as or different from each other, and are each independently a substituted or unsubstituted hydrocarbon ring group having 3 to 60 carbon atoms; or a substituted or unsubstituted heterocyclic group having 2 to 60 carbon atoms.

In another exemplary embodiment, CY1 and CY2 are the same as or different from each other, are each independently a substituted or unsubstituted phenyl group; a substituted or unsubstituted biphenyl group; a substituted or unsubstituted terphenyl group; a substituted or unsubstituted fluorenyl group; a substituted or unsubstituted dihydroanthracenyl group; a substituted or unsubstituted hydroindenyl group; a substituted or unsubstituted napthyl group; a substituted or unsubstituted adamantyl group; a substituted or unsubstituted tetrahydronaphthyl group; a substituted or unsubstituted dibenzofuran group; a substituted or unsubstituted dibenzothiophene group; or a substituted or unsubstituted dibenzothiophene oxide group. In this case, the "substituted or unsubstituted" means being substituted with one or two or more substituents selected from the group consisting of hydrogen; deuterium; a halogen group; a nitrile group; a silyl group having 1 to 30 carbon atoms; an alkyl group having 1 to 20 carbon atoms; a cycloalkyl group having 3 to 30 carbon atoms; an aryl group having 6 to 60 carbon atoms; a heterocyclic group having 2 to 60 carbon atoms, and a substituent to which two or more substituents among the exemplified substituents are linked, or having no substituent.

According to an exemplary embodiment of the present specification, A and B are the same as or different from each other, and are each independently a substituted or unsubstituted hydrocarbon ring having 3 to 60 carbon atoms; or a substituted or unsubstituted hetero ring having 2 to 60 carbon atoms, and A and B may be bonded to each other to form a ring.

In an exemplary embodiment of the present specification, one or more of the substituent group of A, the substituent group of B, and R1 to R3 is or are a group represented by the following Formula 2.

According to another exemplary embodiment, one to three of the substituent group of A, the substituent group of B, and R1 to R3 is or are a group represented by Formula 2.

According to still another exemplary embodiment, one or two of the substituent group of A, the substituent group of B, and R1 to R3 is or are a group represented by Formula 2.

In an exemplary embodiment of the present specification, Formula 1 is represented by any one of the following Formulae 1-1 and 1-2.

[Formula 1-1]

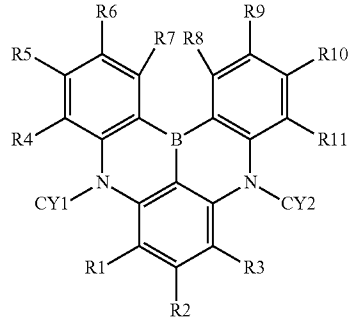

In Formula 1-1,

CY1 and CY2 are the same as or different from each other, and are each independently a substituted or unsubstituted hydrocarbon ring group; or a substituted or unsubstituted heterocyclic group, R1 to R3 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, R4 to R11 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, or are bonded to an adjacent group to form a substituted or unsubstituted ring, one or more of groups of a substituent group of a ring formed by bonding adjacent groups of R4 to R11, a group which does not form a ring among R4 to R11, and R1 to R3 is or are the group represented by Formula 2,

[Formula 1-2]

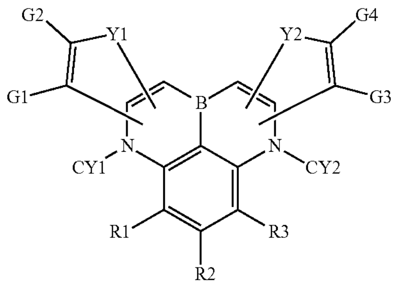

in Formula 1-2,

CY1 and CY2 are the same as or different from each other, and are each independently a substituted or unsubstituted hydrocarbon ring group; or a substituted or unsubstituted heterocyclic group, R1 to R3 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, Y1 and Y2 are the same as or different from each other, and are each independently O; S; or CRaRb, Ra and Rb are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, G1 and G2 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, or a bonded to each other to form a substituted or unsubstituted ring, G3 and G4 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, or are bonded to each other to form a substituted or unsubstituted ring, and one or more of a substituent group of a ring formed by bonding G1 and G2 to each other, a substituent group of a ring formed by bonding G3 and G4 to each other, a group which does not form a ring among G1 to G4, and R1 to R3 is or are the group represented by Formula 2.

According to an exemplary embodiment of the present specification, R1 to R3 are the same as or different from each other, and are each independently hydrogen; deuterium; a halogen group; a nitrile group; a substituted or unsubstituted silyl group having 2 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to an exemplary embodiment of the present specification, R1 to R3 are the same as or different from each other, and are each independently hydrogen; deuterium; a halogen group; an alkyl group having 1 to 20 carbon atoms; or the group represented by Formula 2.

In an exemplary embodiment of the present specification, R4 to R11 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2, or are bonded to an adjacent group to form a substituted or unsubstituted ring having 6 to 60 carbon atoms.

According to an exemplary embodiment of the present specification, R4 to R11 are the same as or different from each other, and are each independently hydrogen; deuterium; an alkyl group having 1 to 20 carbon atoms; an aryl group having 6 to 30 carbon atoms; or the group represented by Formula 2, or are bonded to an adjacent group to form a substituted or unsubstituted cyclopentene; a substituted or unsubstituted cyclohexene; a substituted or unsubstituted hydroindene; a substituted or unsubstituted tetrahydronaphthalene; a substituted or unsubstituted benzofuran; or a substituted or unsubstituted benzothiophene, or R7 and R8 may be linked through —Si— or —C—.

According to an exemplary embodiment of the present specification, in Formula 1-1, one or more of a substituent group of a ring formed by bonding adjacent groups among R4 to R11, a group which does not form a ring among R4 to R11, and R1 to R3 is or are the group represented by Formula 2.

In another exemplary embodiment, in Formula 1-1, one to three of a substituent group of a ring formed by bonding adjacent groups among R4 to R11, a group which does not form a ring among R4 to R11, and R1 to R3 is or are the group represented by Formula 2.

In still another embodiment, in Formula 1-1, one or two of a substituent group of a ring formed by bonding adjacent groups among R4 to R11, a group which does not form a ring among R4 to R11, and R1 to R3 is or are the group represented by Formula 2.

According to an exemplary embodiment of the present specification, Y1 and Y2 are O; S; or CRaRb.

According to another exemplary embodiment, Y1 and Y2 are each O.

According to still another exemplary embodiment, Y1 and Y2 are each S.

According to yet another exemplary embodiment, Y1 and Y2 are each CRaRb.

According to yet another exemplary embodiment, Y1 is 0, and Y2 is S.

According to yet another exemplary embodiment, Y1 is O, and Y2 is CRaRb.

According to yet another exemplary embodiment, Y1 is S, and Y2 is O.

According to yet another exemplary embodiment, Y1 is S, and Y2 is CRaRb.

According to yet another exemplary embodiment, Y1 is CRaRb, and Y2 is O.

According to yet another exemplary embodiment, Y1 is CRaRb, and Y2 is S.

According to an exemplary embodiment of the present specification, Ra and Rb are the same as or different from each other, and are each independently hydrogen; deuterium; a substituted or unsubstituted alkyl group having 1 to 20 carbon atoms; or a substituted or unsubstituted aryl group having 6 to 30 carbon atoms.

In another exemplary embodiment, Ra and Rb are the same as or different from each other, and are each independently hydrogen; deuterium; an alkyl group having 1 to 20 carbon atoms; or an aryl group having 6 to 60 carbon atoms.

In an exemplary embodiment of the present specification, G1 and G2 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2, or are bonded to each other to form a substituted or unsubstituted ring having 6 to 30 carbon atoms.

According to another exemplary embodiment, G1 and G2 are bonded to each other to form a substituted or unsubstituted benzene; or a substituted or unsubstituted tetrahydronaphthalene.

In an exemplary embodiment of the present specification, G3 and G4 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2, or are bonded to each other to form a substituted or unsubstituted ring having 6 to 30 carbon atoms.

According to another exemplary embodiment, G3 and G4 are bonded to each other to form a substituted or unsubstituted benzene; or a substituted or unsubstituted tetrahydronaphthalene.

According to an exemplary embodiment of the present specification, in Formula 1-2, one or more of a substituent group of a ring formed by bonding G1 and G2 to each other, a substituent group of a ring formed by bonding G3 and G4 to each other, a group which does not form a ring among G1 to G4, and R1 to R3 is or are the group represented by Formula 2.

In another exemplary embodiment, in Formula 1-2, one to three of a substituent group of a ring formed by bonding G1 and G2 to each other, a substituent group of a ring formed by bonding G3 and G4 to each other, a group which does not form a ring among G1 to G4, and R1 to R3 is or are the group the group represented by Formula 2.

In still another exemplary embodiment, in Formula 1-2, one or two of a substituent group of a ring formed by bonding G1 and G2 to each other, a substituent group of a ring formed by bonding G3 and G4 to each other, a group which does not a ring among G1 to G4, and R1 to R3 is or are the group represented by Formula 2.

According to an exemplary embodiment of the present specification, Formula 1 is represented by the following 1-1-1.

[Formula 1-1-1]

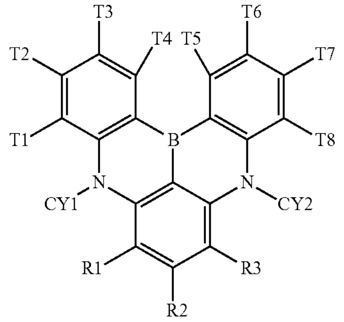

In Formula 1-1-1, definitions of CY1 and CY2 are the same as those in Formula 1, R1 to R3 and T1 to T8 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, and one or more of R1 to R3 and T1 to T8 is or are the group represented by Formula 2.

According to an exemplary embodiment of the present specification, T1 to T8 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T1 to T8 are the same as or different from each other, and are each independently hydrogen; deuterium; an alkyl group having 1 to 20 carbon atoms; or an aryl group having 6 to 30 carbon atoms.

In an exemplary embodiment of the present specification, in Formula 1-1-1, one or more of R1 to R3 and T1 to T8 is or are the group represented by Formula 2.

According to still another exemplary embodiment, in Formula 1-1-1, one to three of R1 to R3 and T1 to T8 is or are the group represented by Formula 2.

According to yet another exemplary embodiment, in Formula 1-1-1, one or two of R1 to R3 and T1 to T8 is or are the group represented by Formula 2.

According to an exemplary embodiment of the present specification, Formula 1 is represented by the following Formula 1-1-2.

[Formula 1-1-2]

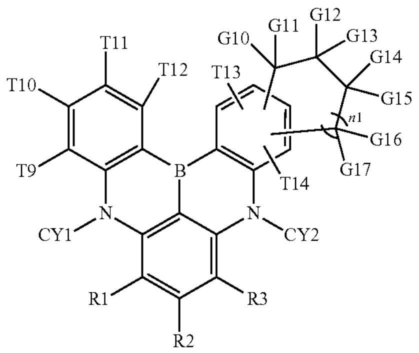

In Formula 1-1-2, definitions of CY1 and CY2 are the same as those in Formula 1, R1 to R3, T9 to T14, and G10 to G17 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n1 is 0 or 1, and one or more of R1 to R3, T9 to T14, and G10 to G17 is or are the group represented by Formula 2.

According to an exemplary embodiment of the present specification, T9 to T14 and G10 to G17 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T9 to T14 and G10 to G17 are the same as or different from each other, and are each independently hydrogen; deuterium; an alkyl group having 1 to 20 carbon atoms; or an aryl group having 6 to 30 carbon atoms.

According to an exemplary embodiment of the present specification, n1 is 0.

According to an exemplary embodiment of the present specification, n1 is 1.

In an exemplary embodiment of the present specification, in Formula 1-1-2, one or more of R1 to R3, T9 to T14, and G10 to G17 is or are the group represented by Formula 2.

According to another exemplary embodiment, in Formula 1-1-2, one to three of R1 to R3, T9 to T14, and G10 to G17 is or are the group represented by Formula 2.

According to still another exemplary embodiment, in Formula 1-1-2, one or two of R1 to R3, T9 to T14, and G10 to G17 is or are the group represented by Formula 2.

In an exemplary embodiment of the present specification, Formula 1 is represented by the following Formula 1-1-3.

[Formula 1-1-3]

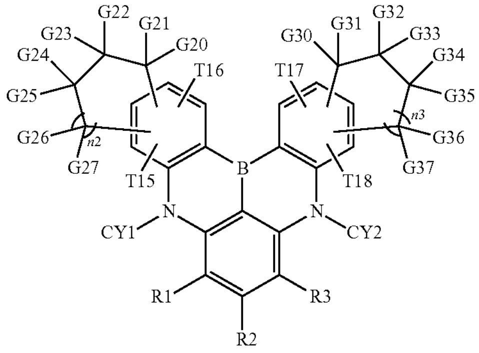

In Formula 1-1-3, definitions of CY1 and CY2 are the same as those in Formula 1, R1 to R3, T15 to T18, G20 to G27, and G30 to G37 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n2 and n3 are each 0 or 1, and one or more of R1 to R3, T15 to T18, G20 to G27, and G30 to G37 is or are the group represented by Formula 2.

According to an exemplary embodiment of the present specification, T15 to T18, G20 to G27, and G30 to G37 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T15 to T18, G20 to G27, and G30 to G37 are the same as or different from each other, and are each independently hydrogen; deuterium; an alkyl group having 1 to 20 carbon atoms; or an aryl group having 6 to 30 carbon atoms.

According to an exemplary embodiment of the present specification, n2 is 0.

According to an exemplary embodiment of the present specification, n2 is 1.

According to an exemplary embodiment of the present specification, n3 is 0.

According to an exemplary embodiment of the present specification, n3 is 1.

According to an exemplary embodiment of the present specification, one or more of R1 to R3, T15 to T18, G20 to G27, and G30 to G37 is or are the group represented by Formula 2.

According to another exemplary embodiment, one to three of R1 to R3, T15 to T18, G20 to G27, and G30 to G37 is or are the group represented by Formula 2.

According to still another exemplary embodiment, one or two of R1 to R3, T15 to T18, G20 to G27, and G30 to G37 is or are the group represented by Formula 2.

In an exemplary embodiment of the present specification, Formula 1 is represented by the following Formula 1-1-4.

[Formula 1-1-4]

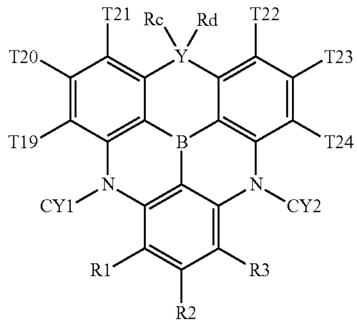

In Formula 1-1-4, definitions of CY1 and CY2 are the same as those in Formula 1, Y is Si or C, R1 to R3 and T19 to T24 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, Rc and Rd are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, and one or more of R1 to R3 and T19 to T24 is or are the group represented by Formula 2.

According to an exemplary embodiment of the present specification, T19 to T24 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T19 to T24 are the same as or different from each other, and are each independently hydrogen; deuterium; an alkyl group having 1 to 20 carbon atoms; or an aryl group having 6 to 30 carbon atoms.

According to an exemplary embodiment of the present specification, Y is Si or C.

In an exemplary embodiment of the present specification, Rc and Rd are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted cycloalkyl group having 3 to 30 carbon atoms; a substituted or unsubstituted aryl group having 6 to 30 carbon atoms; or a substituted or unsubstituted heterocyclic group having 2 to 30 carbon atoms.

In another exemplary embodiment, Rc and Rd are the same as or different from each other, and are each independently hydrogen; an alkyl group having 1 to 20 carbon atoms; or an aryl group having 6 to 30.

According to another exemplary embodiment, Rc and Rd are the same as or different from each other, and are each independently hydrogen; a methyl group; or a phenyl group.

According to an exemplary embodiment of the present specification, in Formula 1-1-4, one or more of R1 to R3 and T19 to T24 is or are the group represented by Formula 2.

In another exemplary embodiment, in Formula 1-1-4, one to three of R1 to R3 and T19 to T24 is or are the group represented by Formula 2.

In still another exemplary embodiment, in Formula 1-1-4, one or two of R1 to R3 and T19 to T24 is or are the group represented by Formula 2.

In an exemplary embodiment of the present specification, Formula 1 is represented by the following Formula 1-1-5.

[Formula 1-1-5]

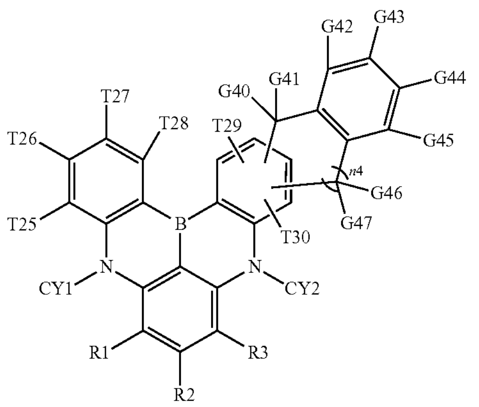

In Formula 1-1-5, definitions of CY1 and CY2 are the same as those in Formula 1, R1 to R3, T25 to T30, and G40 to G47 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n4 is 0 or 1, and one or more of R1 to R3, T25 to T30, and G40 to G47 is or are the group represented by Formula 2.

According to an exemplary embodiment of the present specification, T25 to T30 and G40 to G47 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T25 to T30 and G40 to G47 are the same as or different from each other, and are each independently hydrogen; deuterium; an alkyl group having 1 to 20 carbon atoms; or an aryl group having 6 to 30 carbon atoms.

According to an exemplary embodiment of the present specification, n4 is 0.

According to an exemplary embodiment of the present specification, n4 is 1.

According to an exemplary embodiment of the present specification, in Formula 1-1-5, one or more of R1 to R3, T25 to T30, and G40 to G47 is or are the group represented by Formula 2.

In another exemplary embodiment, in Formula 1-1-5, one to three of R1 to R3, T25 to T30, and G40 to G47 is or are the group represented by Formula 2.

In still another exemplary embodiment, in Formula 1-1-5, one or two of R1 to R3, T25 to T30, and G40 to G47 is or are the group represented by Formula 2.

According to an exemplary embodiment of the present specification, Formula 1 is represented by the following Formula 1-1-6.

[Formula 1-1-6]

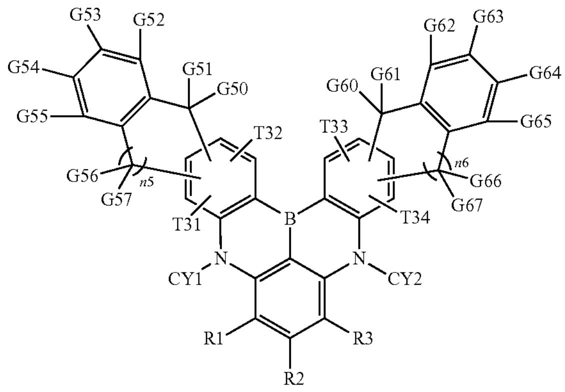

In Formula 1-1-6, definitions of CY1 and CY2 are the same as those in Formula 1, R1 to R3, T31 to T34, G50 to G57, and G60 to G67 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n5 and n6 are each 0 or 1, and one or more of R1 to R3, T31 to T34, G50 to G57, and G60 to G67 is or are the group represented by Formula 2.

According to an exemplary embodiment of the present specification, T31 to T34, G50 to G57, and G60 to G67 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T31 to T34, G50 to G57, and G60 to G67 are the same as or different from each other, and are each independently hydrogen; deuterium; an alkyl group having 1 to 20 carbon atoms; or an aryl group having 6 to 30 carbon atoms.

According to an exemplary embodiment of the present specification, n5 is 0.

According to an exemplary embodiment of the present specification, n5 is 1.

According to an exemplary embodiment of the present specification, n6 is 0.

According to an exemplary embodiment of the present specification, n6 is 1.

According to an exemplary embodiment of the present specification, in Formula 1-1-6, one or more of R1 to R3, T31 to T34, G50 to G57, and G60 to G67 is or are the group represented by Formula 2.

In another exemplary embodiment, in Formula 1-1-6, one to three of R1 to R3, T31 to T34, G50 to G57, and G60 to G67 is or are the group represented by Formula 2.

In still another exemplary embodiment, in Formula 1-1-6, one or two of R1 to R3, T31 to T34, G50 to G57, and G60 to G67 is or are the group represented by Formula 2.

In an exemplary embodiment of the present specification, Formula 1 is represented by the following Formula 1-1-7.

[Formula 1-1-7]

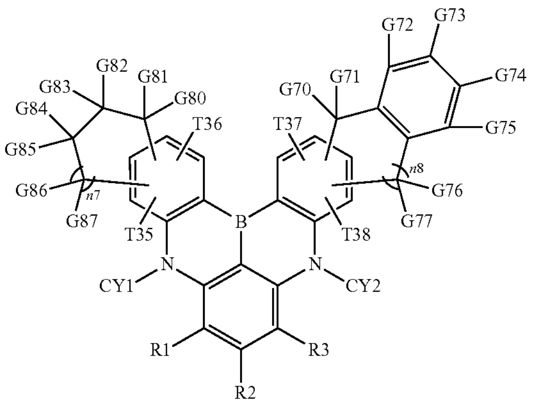

In Formula 1-1-7, definitions of CY1 and CY2 are the same as those in Formula 1, R1 to R3, T35 to T38, G70 to G77, and G80 to G87 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n7 and n8 are each 0 or 1, and one or more of R1 to R3, T35 to T38, G70 to G77, and G80 to G87 is or are the group represented by Formula 2.

According to an exemplary embodiment of the present specification, T35 to T38, G70 to G77, and G80 to G87 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T35 to T38, G70 to G77, and G80 to G87 are the same as or different from each other, and are each independently hydrogen; deuterium; an alkyl group having 1 to 20 carbon atoms; or an aryl group having 6 to 30 carbon atoms.

According to an exemplary embodiment of the present specification, n7 is 0.

According to an exemplary embodiment of the present specification, n7 is 1.

According to an exemplary embodiment of the present specification, n8 is 0.

According to an exemplary embodiment of the present specification, n8 is 1.

According to an exemplary embodiment of the present specification, in Formula 1-1-7, one or more of R1 to R3, T35 to T38, G70 to G77, and G80 to G87 is or are the group represented by Formula 2.

In another exemplary embodiment, in Formula 1-1-7, one to three of R1 to R3, T35 to T38, G70 to G77, and G80 to G87 is or are the group represented by Formula 2.

In still another exemplary embodiment, in Formula 1-1-7, one or two of R1 to R3, T35 to T38, G70 to G77, and G80 to G87 is or are the group represented by Formula 2.

In an exemplary embodiment of the present specification, Formula 1 is represented by the following Formula 1-1-8.

[Formula 1-1-8]

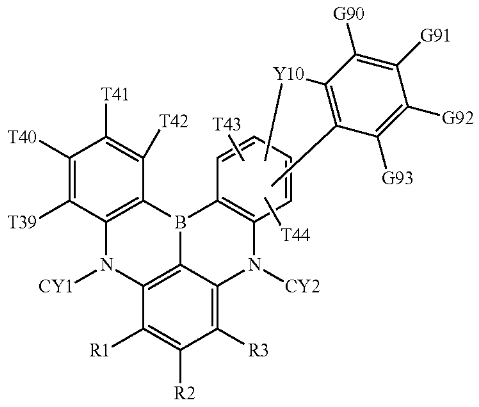

In Formula 1-1-8, definitions of CY1 and CY2 are the same as those in Formula 1, Y10 is O, S, or CReRf, Re and Rf are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3, T39 to T44, and G90 to G93 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, and one or more of R1 to R3, T39 to T44, and G90 to G93 is or are the group represented by Formula 2.

According to an exemplary embodiment of the present specification, T39 to T44 and G90 to G93 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T39 to T44 and G90 to G93 are the same as or different from each other, and are each independently hydrogen; deuterium; an alkyl group having 1 to 20 carbon atoms; or an aryl group having 6 to 30 carbon atoms.

According to an exemplary embodiment of the present specification, Y10 is O, S, or CReRf.

In an exemplary embodiment of the present specification, Re and Rf are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted cycloalkyl group having 3 to 30 carbon atoms; a substituted or unsubstituted aryl group having 6 to 30 carbon atoms; or a substituted or unsubstituted heterocyclic group having 2 to 30 carbon atoms.

According to another exemplary embodiment, Re and Rf are the same as or different from each other, and are each independently hydrogen; deuterium; an alkyl group having 1 to 20 carbon atoms; or an aryl group having 6 to 60 carbon atoms.

According to an exemplary embodiment of the present specification, in Formula 1-1-8, one or more of R1 to R3, T39 to T44, and G90 to G93 is or are the group represented by Formula 2.

In another exemplary embodiment, in Formula 1-1-8, one to three of R1 to R3, T39 to T44, and G90 to G93 is or are the group represented by Formula 2.

In still another exemplary embodiment, in Formula 1-1-8, one or two of R1 to R3, T39 to T44, and G90 to G93 is or are the group represented by Formula 2.

In an exemplary embodiment of the present specification, Formula 1 is represented by the following Formula 1-1-9.

[Formula 1-1-9]

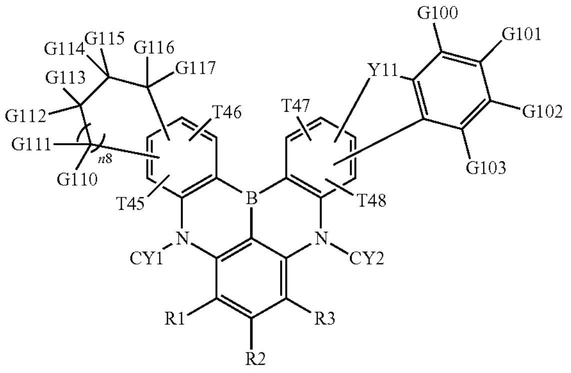

In Formula 1-1-9, definitions of CY1 and CY2 are the same as those in Formula 1, Y11 is O, S, or CRgRh, Rg and Rh are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3, T45 to T48, G100 to G103, and G110 to G117 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n8 is 0 or 1, and one or more of R1 to R3, T45 to T48, G100 to G103, and G110 to G117 is or are the group represented by Formula 2.

According to an exemplary embodiment of the present specification, T45 to T48, G100 to G103, and G110 to G117 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, T45 to T48, G100 to G103, and G110 to G117 are the same as or different from each other, and are each independently hydrogen; deuterium; an alkyl group having 1 to 20 carbon atoms; or an aryl group having 6 to 30 carbon atoms.

According to an exemplary embodiment of the present specification, Y11 is O, S, or CRgRh.

In an exemplary embodiment of the present specification, Rg and Rh are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted cycloalkyl group having 3 to 30 carbon atoms; a substituted or unsubstituted aryl group having 6 to 30 carbon atoms; or a substituted or unsubstituted heterocyclic group having 2 to 30 carbon atoms.

According to another exemplary embodiment, Rg and Rh are the same as or different from each other, and are each independently hydrogen; deuterium; an alkyl group having 1 to 20 carbon atoms; or an aryl group having 6 to 60 carbon atoms.

In an exemplary embodiment of the present specification, n8 is 0.

In an exemplary embodiment of the present specification, n8 is 1.

According to an exemplary embodiment of the present specification, in Formula 1-1-9, one or more of R1 to R3, T45 to T48, G100 to G103, and G110 to G117 is or are the group represented by Formula 2.

In another exemplary embodiment, in Formula 1-1-9, one to three of R1 to R3, T45 to T48, G100 to G103, and G110 to G117 is or are the group represented by Formula 2.

In still another exemplary embodiment, in Formula 1-1-9, one or two of R1 to R3, T45 to T48, G100 to G103, and G110 to G117 is or are the group represented by Formula 2.

According to an exemplary embodiment of the present specification, Formula 1 is represented by the following Formula 1-2-1.

[Formula 1-2-1]

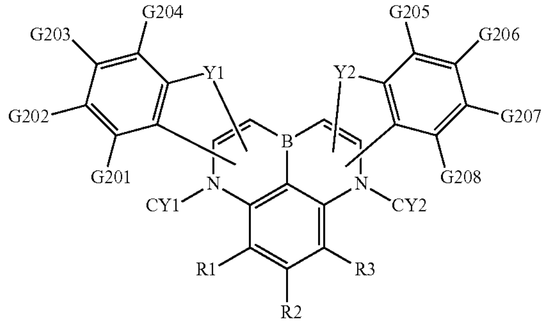

In Formula 1-2-1, definitions of CY1 and CY2 are the same as those in Formula 1, Y1 and Y2 are the same as or different from each other, and are each independently O; S; or CRaRb, Ra and Rb are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3 and G201 to G208 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, and one or more of R1 to R3 and G201 to G208 is or are the group represented by Formula 2.

According to an exemplary embodiment of the present specification, definitions of Y1, Y2, Ra, and Rb in Formula 1-2-1 are the same as those described above.

According to an exemplary embodiment of the present specification, G201 to G208 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, G201 to G208 are the same as or different from each other, and are each independently hydrogen; deuterium; an alkyl group having 1 to 20 carbon atoms; or an aryl group having 6 to 30 carbon atoms.

According to an exemplary embodiment of the present specification, in Formula 1-2-1, one or more of R1 to R3 and G201 to G208 is or are the group represented by Formula 2.

In another exemplary embodiment, in Formula 1-2-1, one to three of R1 to R3 and G201 to G208 is or are the group represented by Formula 2.

In still another exemplary embodiment, in Formula 1-2-1, one or two of R1 to R3 and G201 to G208 is or are the group represented by Formula 2.

According to an exemplary embodiment of the present specification, Formula 1 is represented by the following Formula 1-2-2.

[Formula 1-2-2]

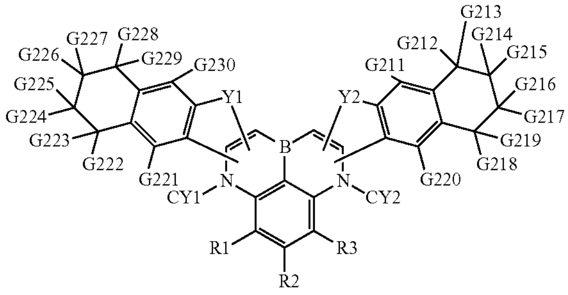

In Formula 1-2-2, definitions of CY1 and CY2 are the same as those in Formula 1, Y1 and Y2 are the same as or different from each other, and are each independently O; S; or CRaRb, Ra and Rb are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3 and G211 to G230 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, and one or more of R1 to R3 and G211 to G230 is or are the group represented by Formula 2.

According to an exemplary embodiment of the present specification, definitions of Y1, Y2, Ra, and Rb in Formula 1-2-2 are the same as those described above.

According to an exemplary embodiment of the present specification, G211 to G230 are the same as or different from each other, and are each independently hydrogen; deuterium; a halogen group; a nitrile group; a substituted or unsubstituted silyl group having 1 to 20 carbon atoms; a substituted or unsubstituted boron group having 1 to 20 carbon atoms; a substituted or unsubstituted alkyl group having 1 to 20 carbon atoms; a substituted or unsubstituted alkenyl group having 2 to 20 carbon atoms; a substituted or unsubstituted alkynyl group having 2 to 20 carbon atoms; a substituted or unsubstituted alkoxy group having 1 to 20 carbon atoms; a substituted or unsubstituted aryloxy group having 6 to 30 carbon atoms; a substituted or unsubstituted cycloalkyl group having 3 to 30 carbon atoms; a substituted or unsubstituted aryl group having 6 to 30 carbon atoms; a substituted or unsubstituted heterocyclic group having 2 to 30 carbon atoms; or the group represented by Formula 2.

According to another exemplary embodiment, G211 to G230 are the same as or different from each other, and are each independently hydrogen; deuterium; an alkyl group having 1 to 20 carbon atoms; or an aryl group having 6 to 30 carbon atoms.

According to an exemplary embodiment of the present specification, in Formula 1-2-2, one or more of R1 to R3 and G211 to G230 is or are the group represented by Formula 2.

In another exemplary embodiment, in Formula 1-2-2, one to three of R1 to R3 and G211 to G230 is or are the group represented by Formula 2.

In still another exemplary embodiment, in Formula 1-2-2, one or two of R1 to R3 and G211 to G230 is or are the group represented by Formula 2.

According to an exemplary embodiment of the present specification, A1 is a substituted or unsubstituted aromatic hydrocarbon ring having 6 to 60 carbon atoms.

In yet another exemplary embodiment, A1 is a substituted or unsubstituted aromatic hydrocarbon ring having 6 to 30 carbon atoms.

According to another exemplary embodiment, A1 is a substituted or unsubstituted benzene; a substituted or unsubstituted naphthalene; a substituted or unsubstituted anthracene; a substituted or unsubstituted phenanthrene; or a substituted or unsubstituted pyrene.

According to an exemplary embodiment of the present specification, A2 is a substituted or unsubstituted alicyclic hydrocarbon ring having 3 to 60 carbon atoms.

In yet another exemplary embodiment, A-2 is a substituted or unsubstituted alicyclic hydrocarbon ring having 3 to 30 carbon atoms.

According to another exemplary embodiment, A-2 is a substituted or unsubstituted cyclobutane; a substituted or unsubstituted cyclopentane; a substituted or unsubstituted cyclohexane; a substituted or unsubstituted cycloheptane; a substituted or unsubstituted cyclooctane; a substituted or unsubstituted decahydronaphthalene; a substituted or unsubstituted tetradecahydrophenanthrene; or tetrahydronaphthalene.

According to an exemplary embodiment of the present specification, Formula 2 is represented by any one of the following Formulae 2-1 to 2-11.

[Formula 2-1]

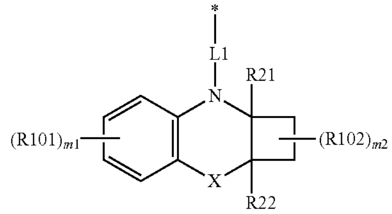

[Formula 2-2]

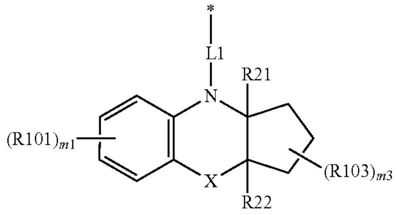

[Formula 2-3]

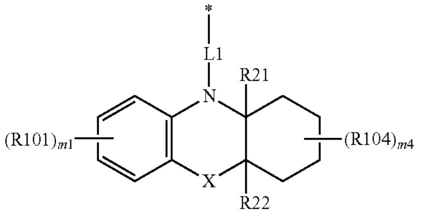

-continued

[Formula 2-4]

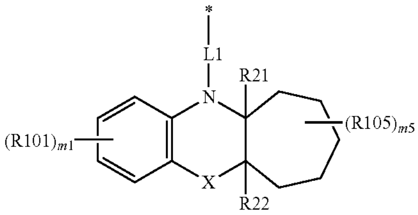

[Formula 2-5]

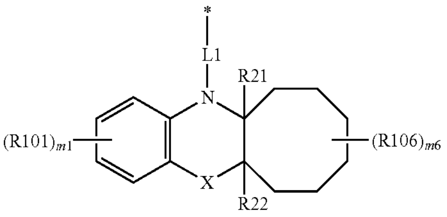

[Formula 2-6]

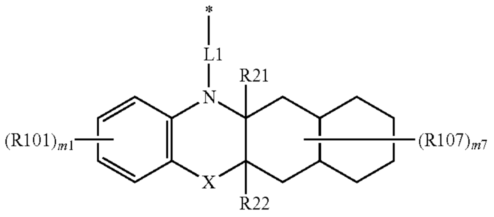

[Formula 2-7]

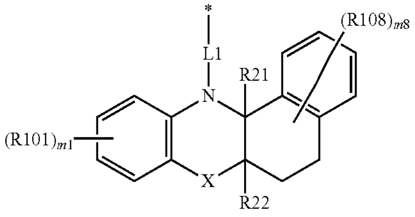

[Formula 2-8]

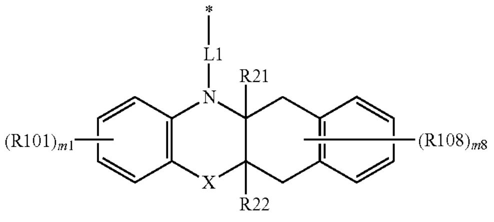

[Formula 2-9]

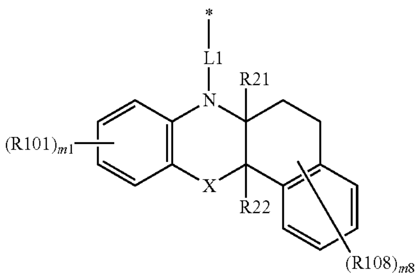

-continued

[Formula 2-10]

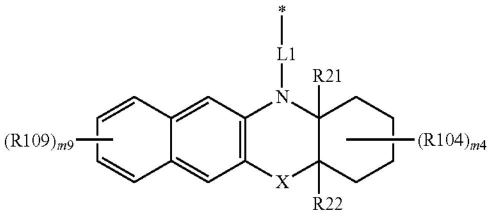

[Formula 2-11]

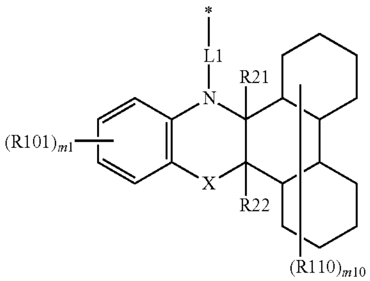

In Formulae 2-1 to 2-11, definitions of L1, X, R21, and R22 are the same as those defined in Formula 2, R101 to R110 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted amine group; a substituted or unsubstituted aryl group; or a substituted or unsubstituted heterocyclic group, m1 and m2 are each an integer from 0 to 4, m3 and m9 are each an integer from 0 to 6, m4 and m8 are each an integer from 0 to 8, m5 is an integer from 0 to 10, m6 is an integer from 0 to 12, m7 is an integer from 0 to 14, and m10 is an integer from 0 to 20, and when m1 to m10 are each 2 or higher, two or more substituents in the parenthesis are the same as or different from each other.

In an exemplary embodiment of the present specification, R101 to R110 are the same as or different from each other, and are each independently hydrogen; deuterium; a halogen group; a nitrile group; a substituted or unsubstituted silyl group; a substituted or unsubstituted boron group; a substituted or unsubstituted alkyl group having 1 to 60 carbon atoms; a substituted or unsubstituted alkenyl group having 2 to 60 carbon atoms; a substituted or unsubstituted alkynyl group having 2 to 60 carbon atoms; a substituted or unsubstituted alkoxy group having 1 to 60 carbon atoms; a substituted or unsubstituted aryloxy group having 6 to 60 carbon atoms; a substituted or unsubstituted cycloalkyl group having 3 to 60 carbon atoms; a substituted or unsubstituted arylamine group having 6 to 60 carbon atoms; a substituted or unsubstituted aryl group having 6 to 60 carbon atoms; or a substituted or unsubstituted heterocyclic group having 2 to 60 carbon atoms.

In another exemplary embodiment, R101 to R110 are the same as or different from each other, and are each independently hydrogen; deuterium; a halogen group; a nitrile group; a substituted or unsubstituted silyl group; a substituted or unsubstituted boron group; a substituted or unsubstituted alkyl group having 1 to 30 carbon atoms; a substituted or unsubstituted alkenyl group having 2 to 30 carbon atoms; a substituted or unsubstituted alkynyl group having 2 to 30 carbon atoms; a substituted or unsubstituted alkoxy group having 1 to 30 carbon atoms; a substituted or unsubstituted aryloxy group having 6 to 30 carbon atoms; a substituted or unsubstituted cycloalkyl group having 3 to 30 carbon atoms; a substituted or unsubstituted arylamine group having 6 to 30 carbon atoms; a substituted or unsubstituted aryl group having 6 to 30 carbon atoms; or a substituted or unsubstituted heterocyclic group having 2 to 30 carbon atoms. The "substituted or unsubstituted" means being substituted with one or two or more substituents selected from the group consisting of hydrogen; deuterium; a halogen group; a nitrile group; a silyl group; a boron group; an alkyl group; an alkenyl group; an alkynyl group; a cycloalkyl group; an alkoxy group; an aryloxy group; an amine group; an aryl group; a heterocyclic group, and a substituent to which two or more substituents among the exemplified substituents are linked, or having no substituent.

According to an exemplary embodiment of the present specification, R101 to R110 are the same as or different from each other, and are each independently hydrogen; deuterium; a halogen group; a nitrile group; an alkyl group having 1 to 20 carbon atoms, which is unsubstituted or substituted with CD3; an arylamine group having 6 to 30 carbon atoms, which is unsubstituted or substituted with an alkyl group having 1 to 20 carbon atoms; an aryl group having 6 to 30 carbon atoms, which is unsubstituted or substituted with an alkyl group having 1 to 20 carbon atoms; a substituted or unsubstituted alkylsilyl group having 1 to 20 carbon atoms; a substituted or unsubstituted arylsilyl group having 6 to 30 carbon atoms; or a heteroaryl group having 2 to 30 carbon atoms.

In still another exemplary embodiment, R101 to R110 are the same as or different from each other, and are each independently hydrogen; deuterium; a halogen group; a nitrile group; a methyl group which is unsubstituted or substituted with CD3; a tert-butyl group; a diphenylamine group which is unsubstituted or substituted with a tert-butyl group; a phenyl group which is unsubstituted or substituted with a methyl group or deuterium; a trimethylsilyl group; a triphenylsilyl group; a pyridine group; or a pyrimidine group.

According to an exemplary embodiment of the present specification, Formula 2 may be represented by any one of the following structures, but is not limited thereto. The following * means a position bonded to Formula 1.

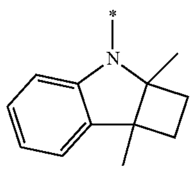
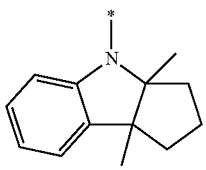
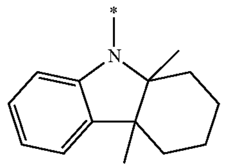
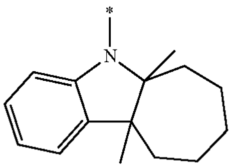

-continued

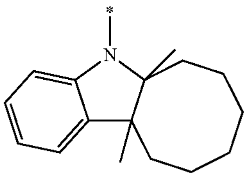
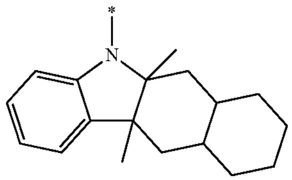
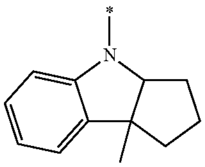
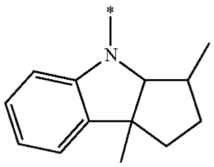
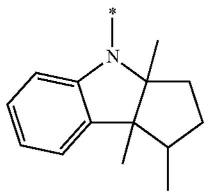
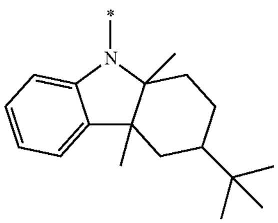
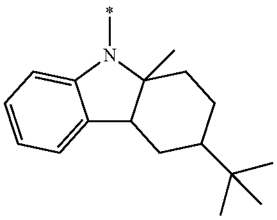
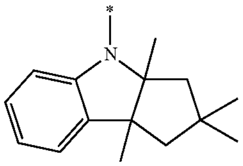
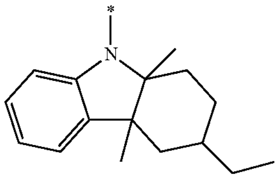
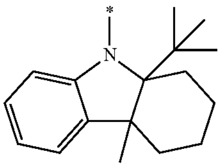
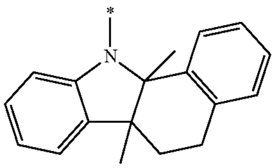
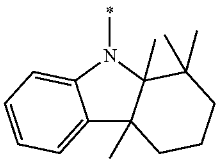
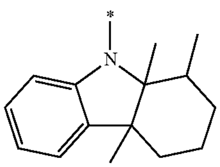
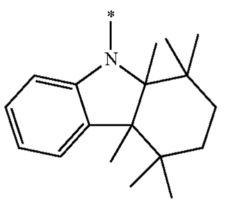
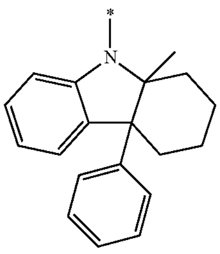
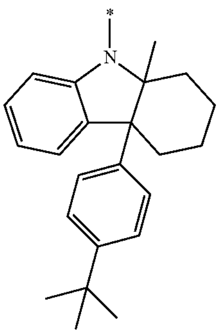

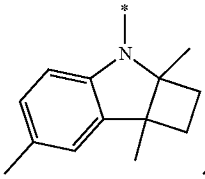
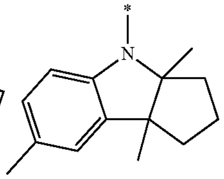
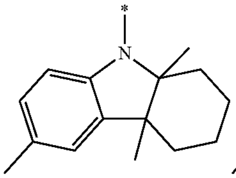
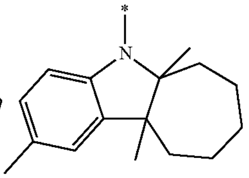
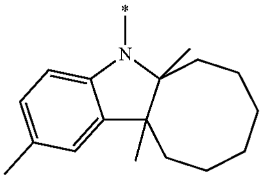
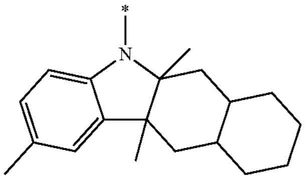
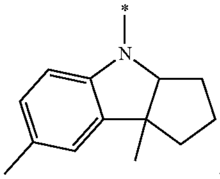
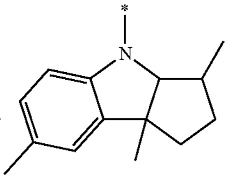
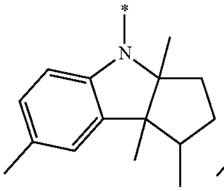
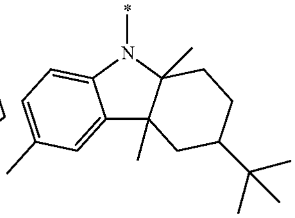
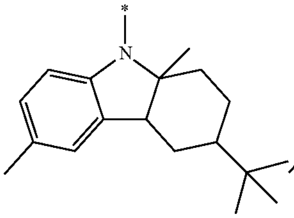
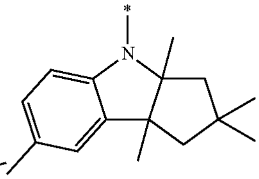
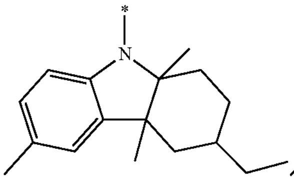
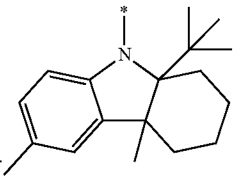
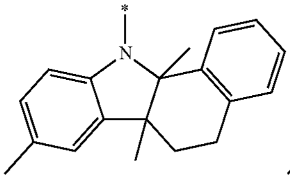
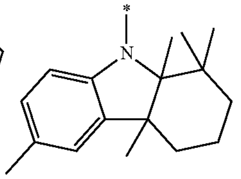
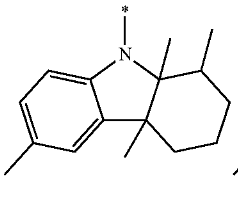
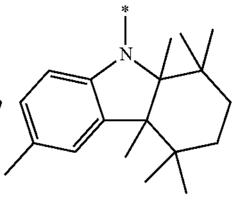
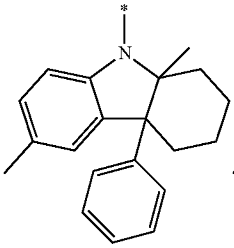
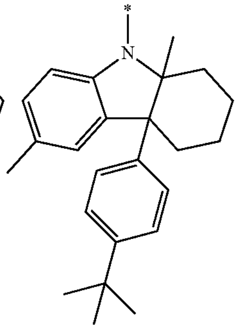
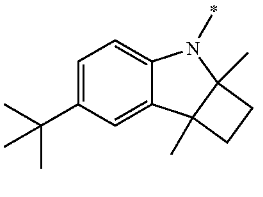
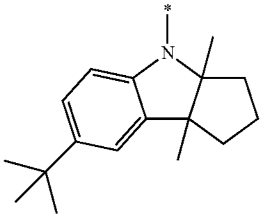
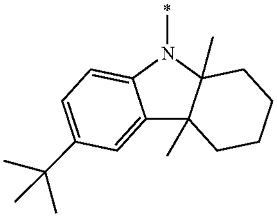
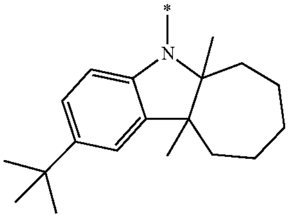
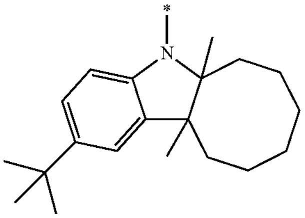
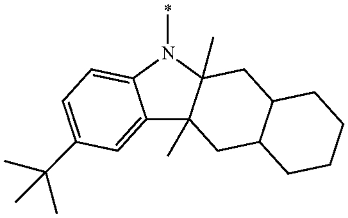
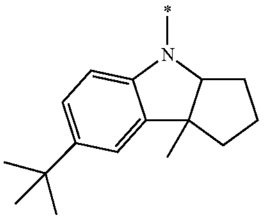
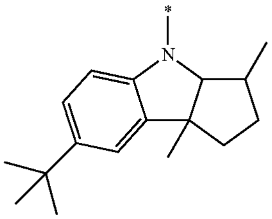
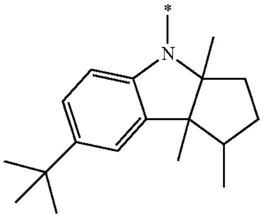

-continued
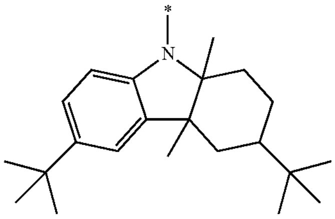
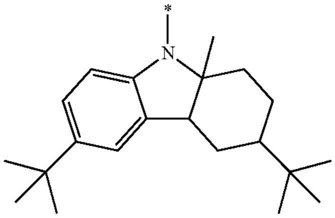
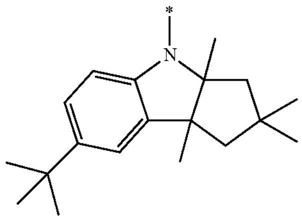
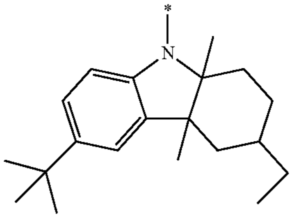
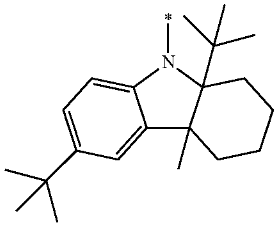
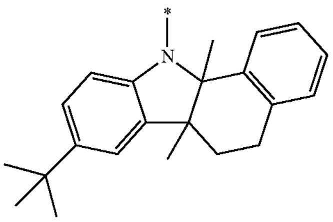
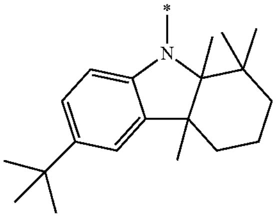
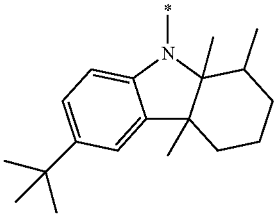
-continued
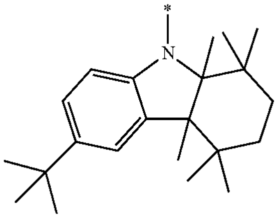
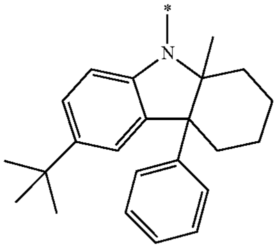
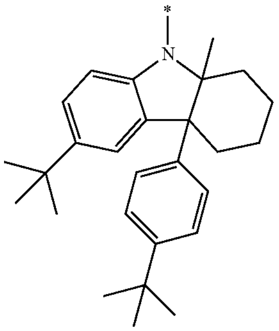
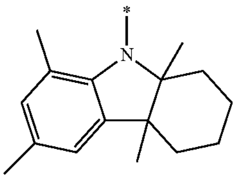
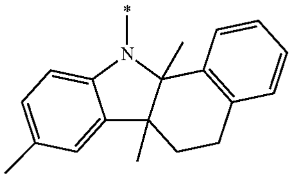
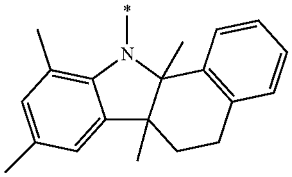
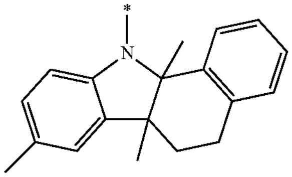
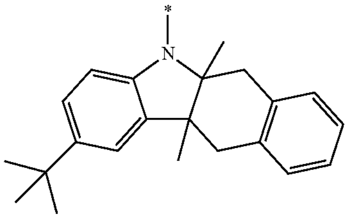
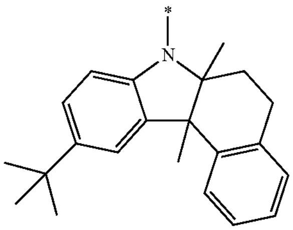
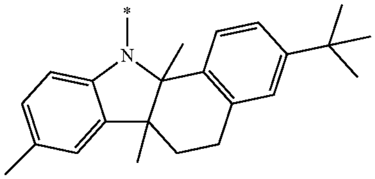

-continued
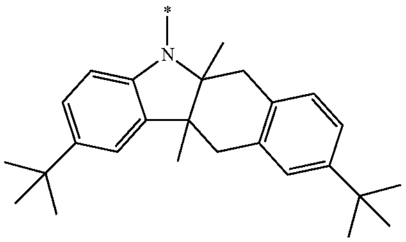
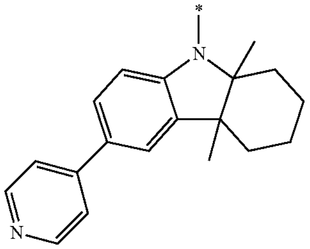
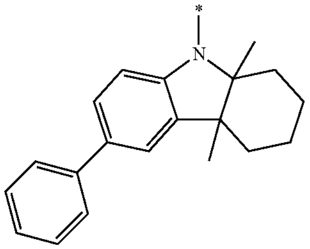
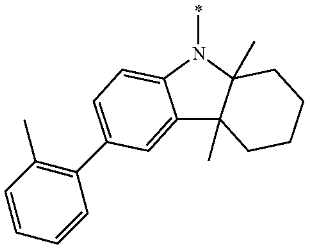
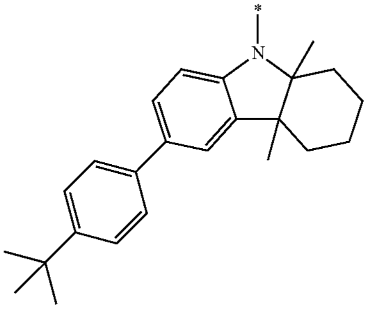
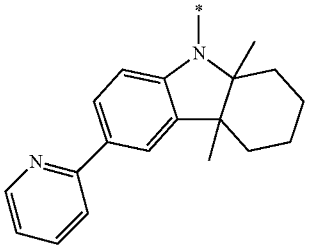
-continued
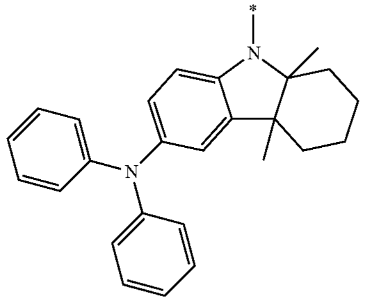
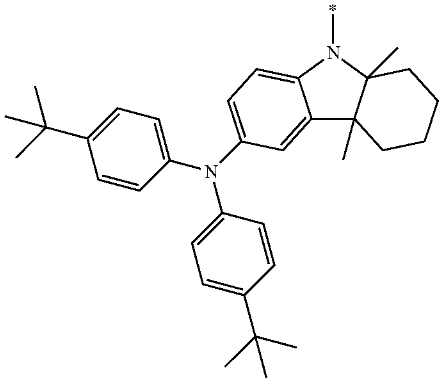
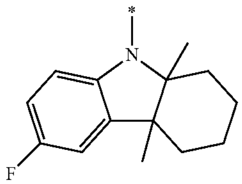
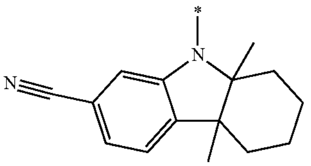
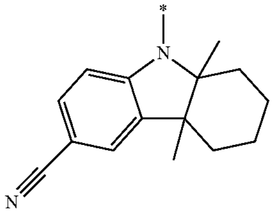
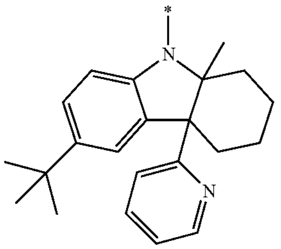
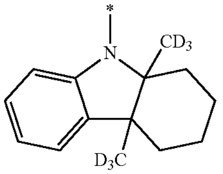
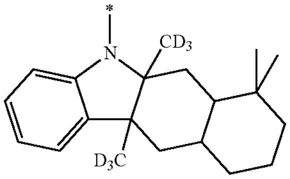
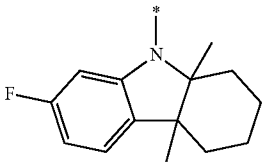
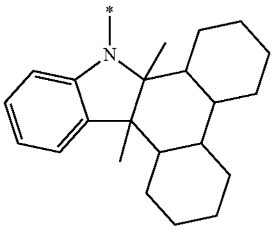
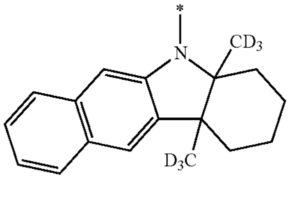
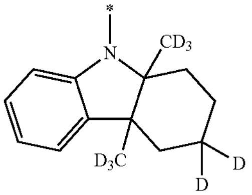

-continued
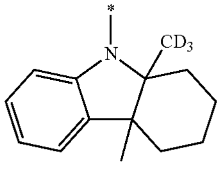
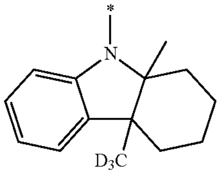
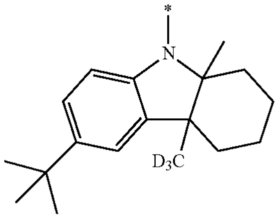
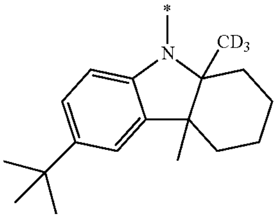
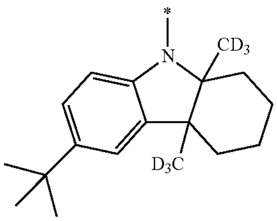
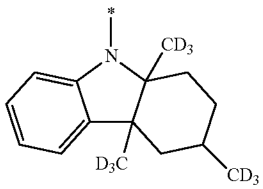
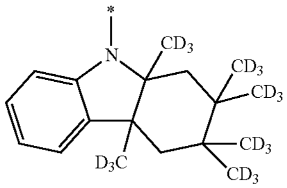
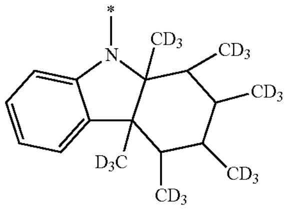
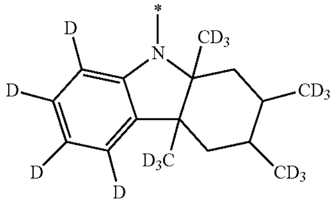
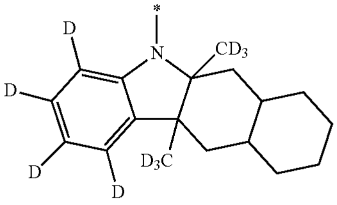
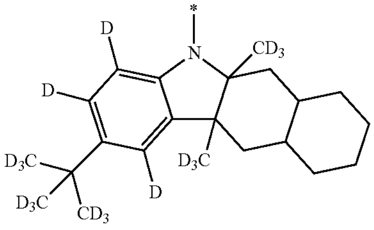
-continued
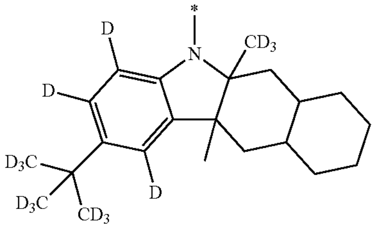
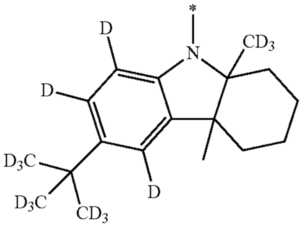
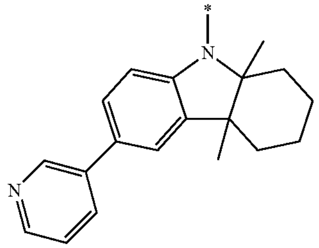
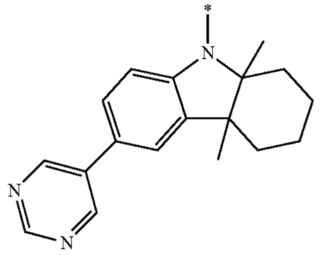
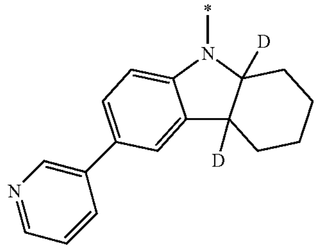
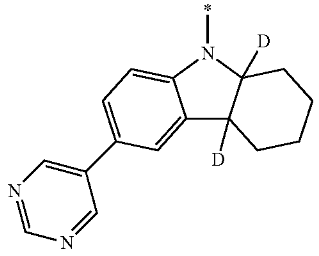
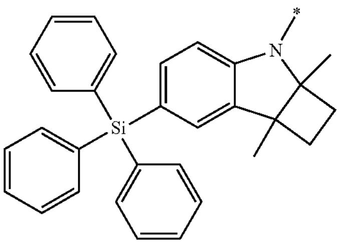

-continued
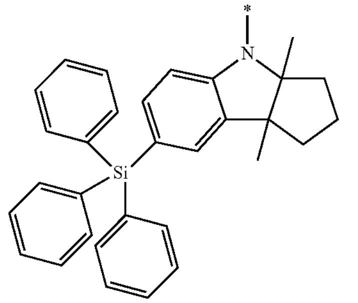
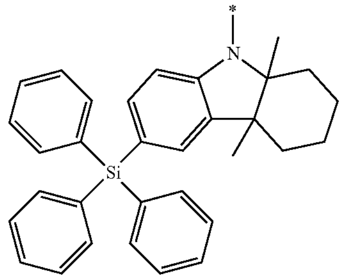
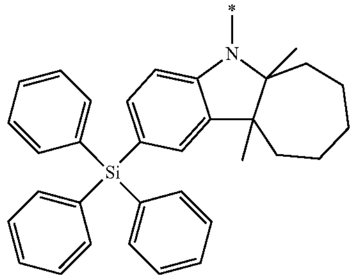
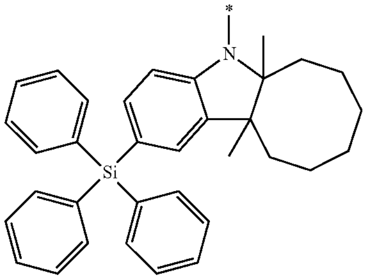
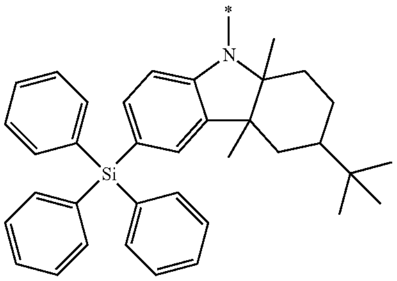
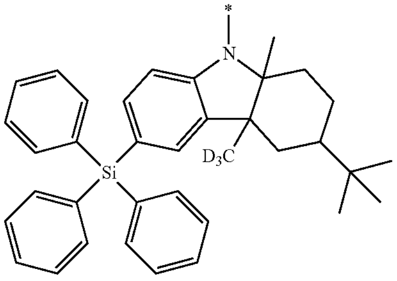
-continued
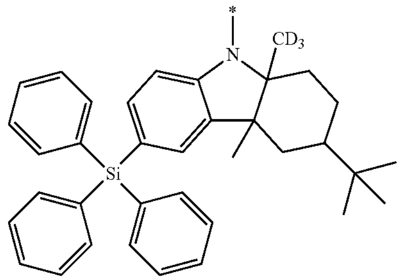
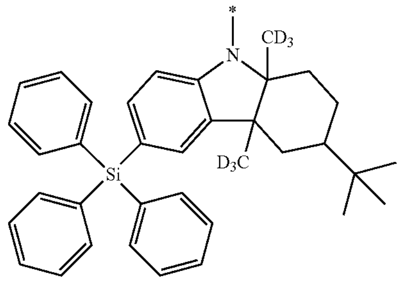
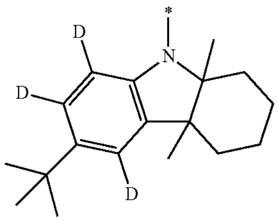
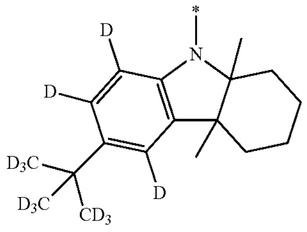
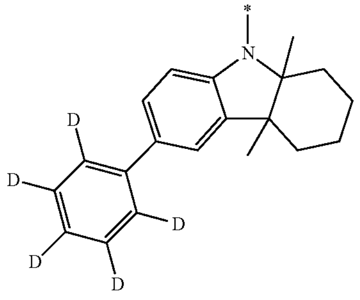
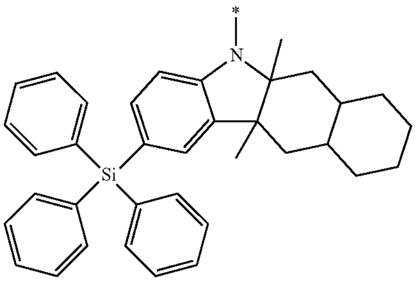

-continued
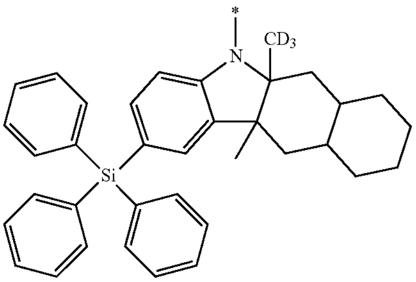
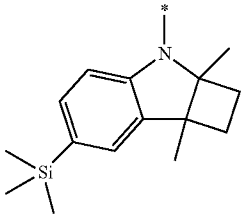
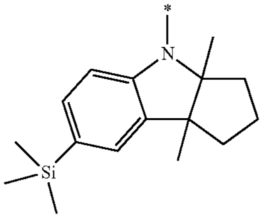
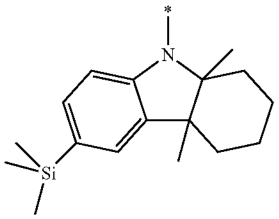
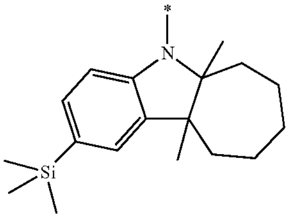
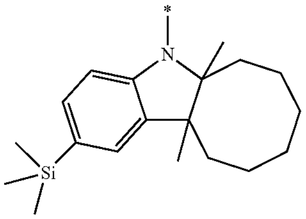
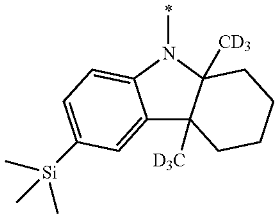
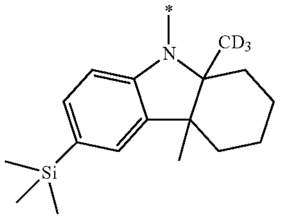
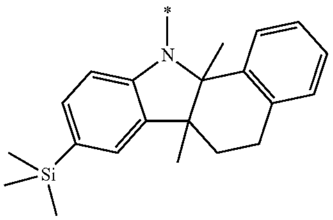
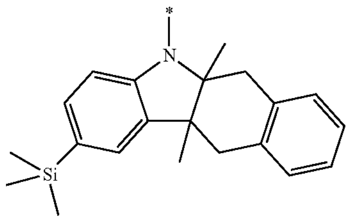
-continued
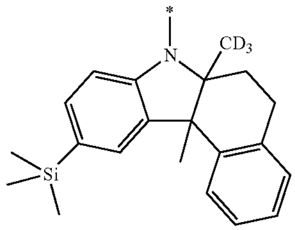
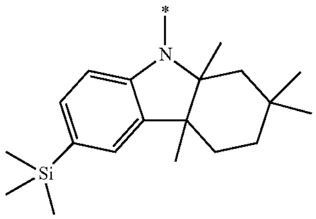
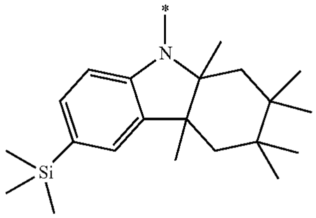
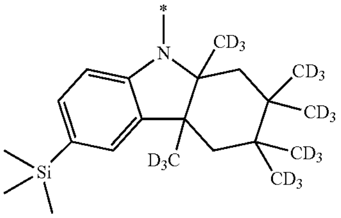
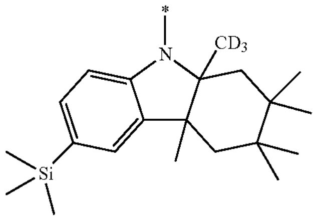
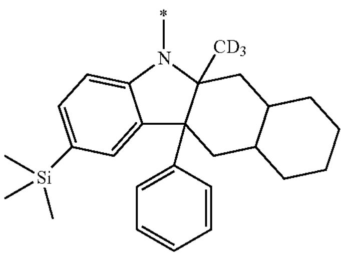
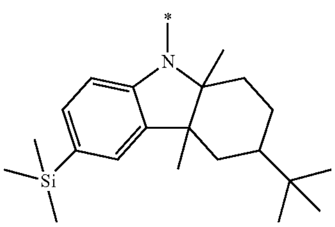

-continued
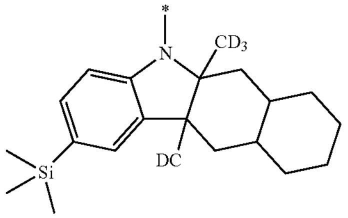
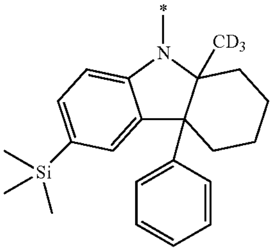
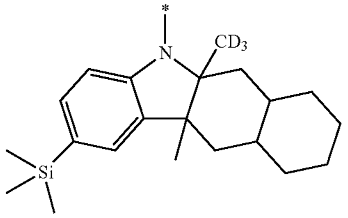
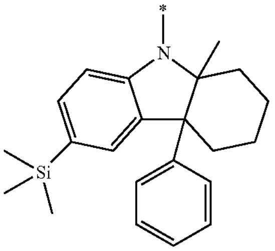
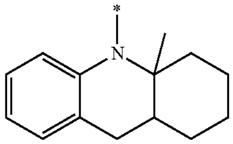
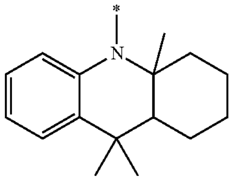
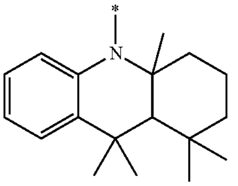
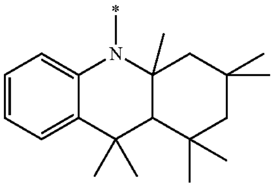
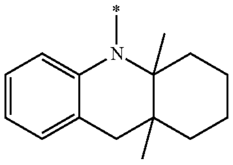
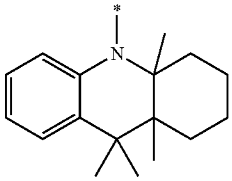
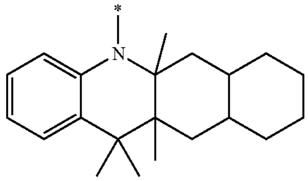
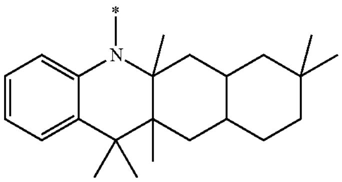
-continued
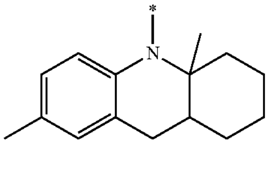
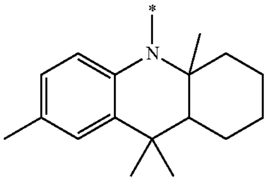
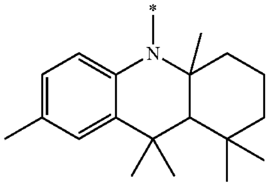
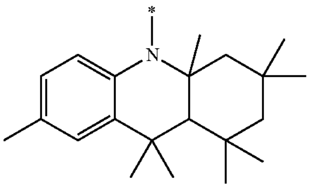
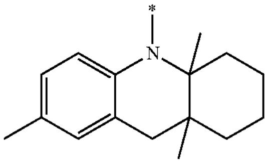
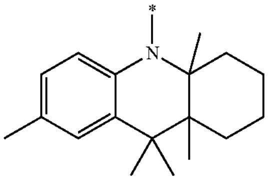
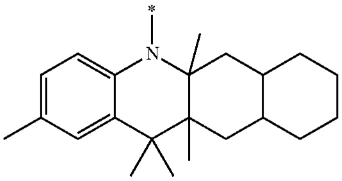
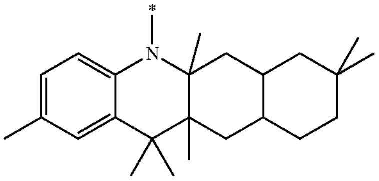
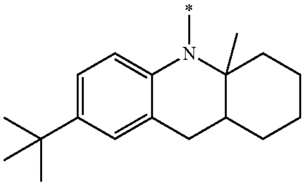
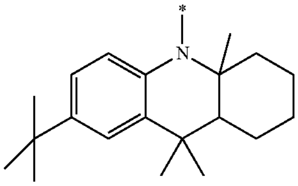
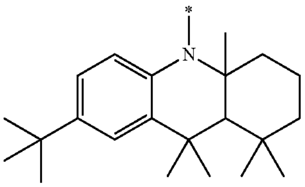

-continued
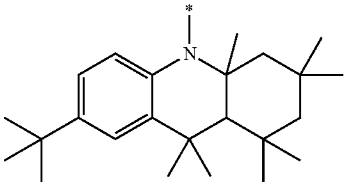
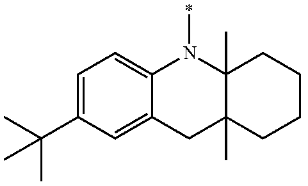
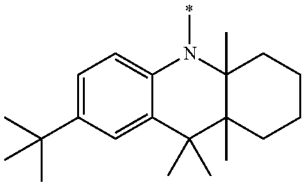
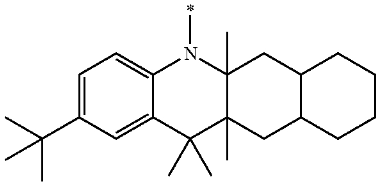
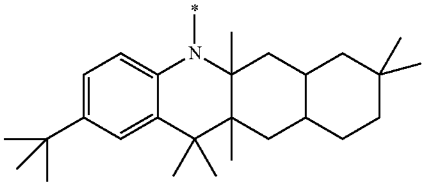
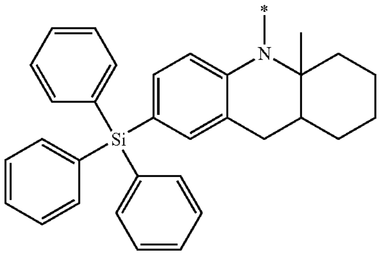
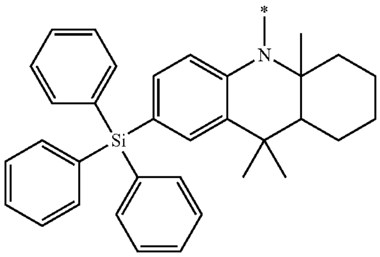
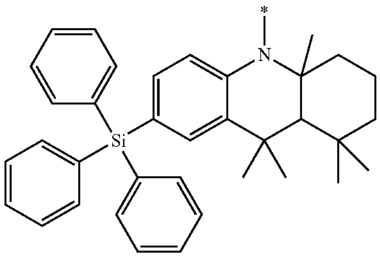
-continued
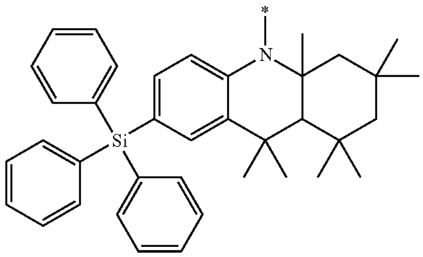
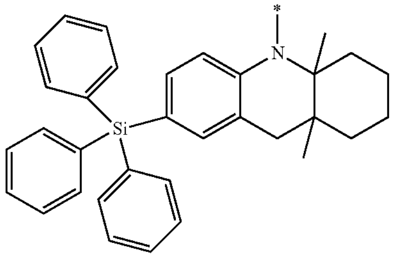
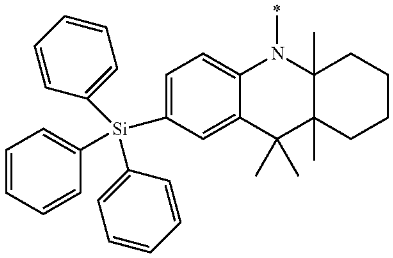
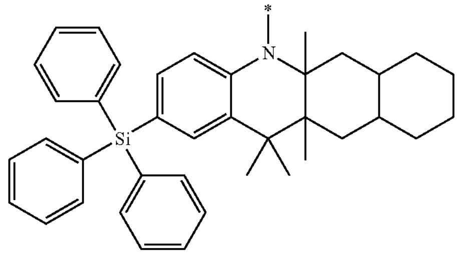
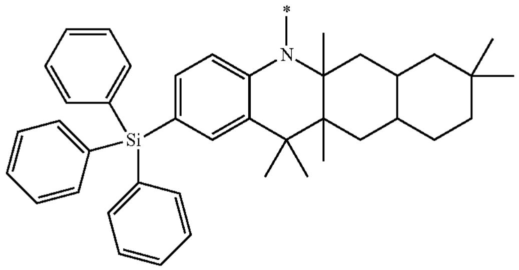
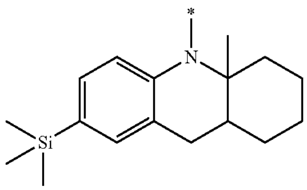
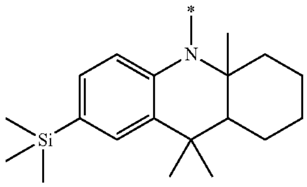

-continued
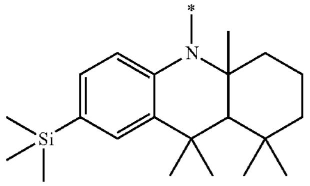
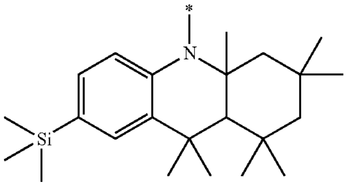
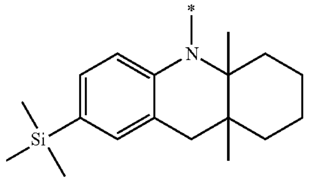
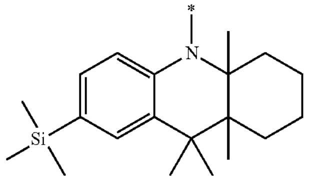
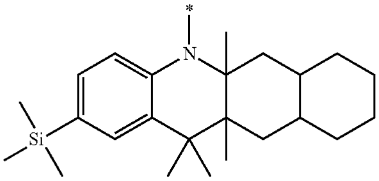
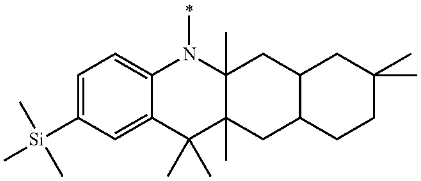
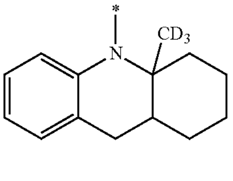
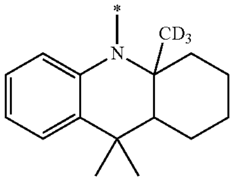
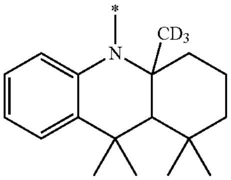
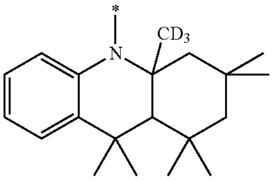
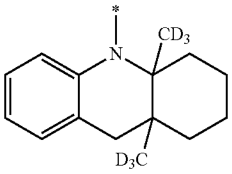
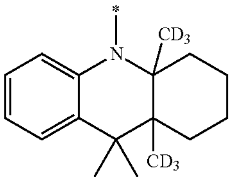
-continued
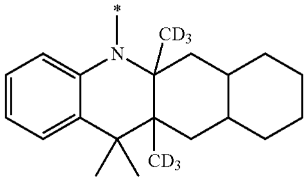
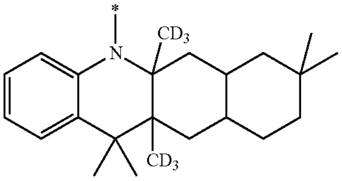
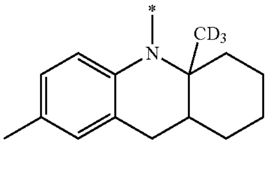
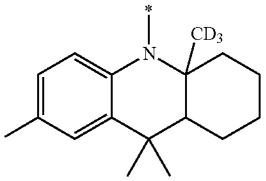
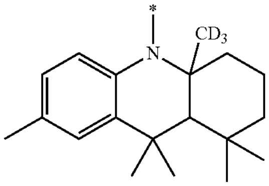
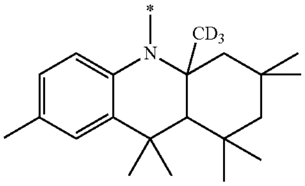
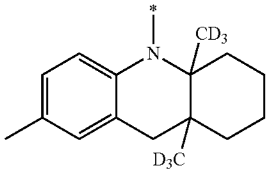
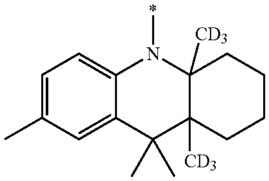
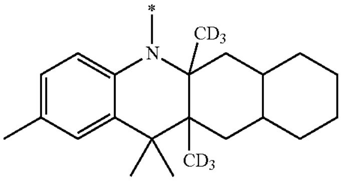
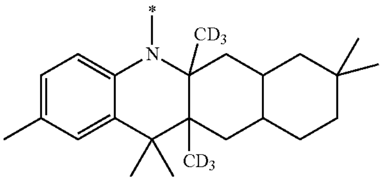
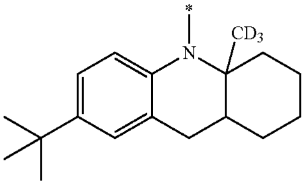

-continued
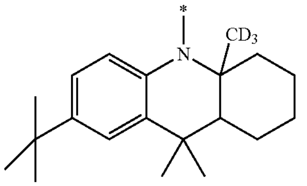
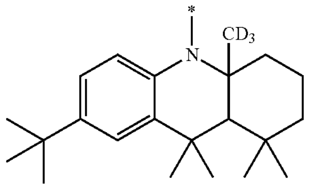
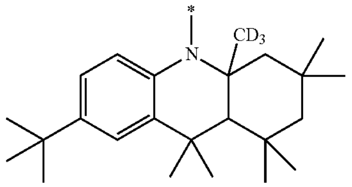
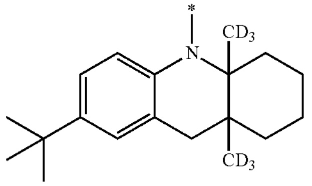
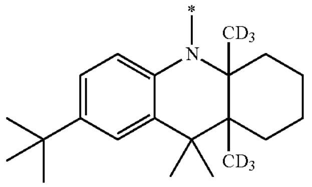
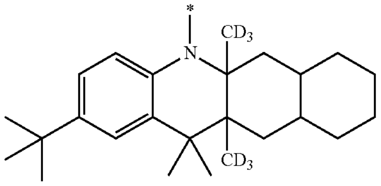
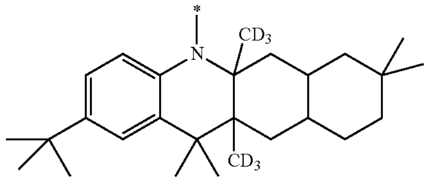
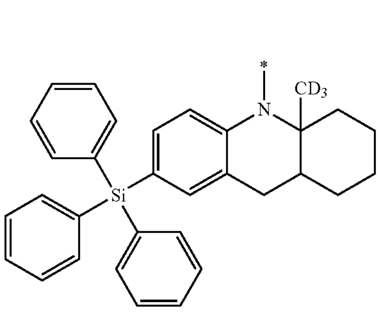
-continued
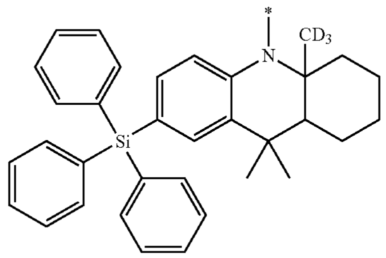
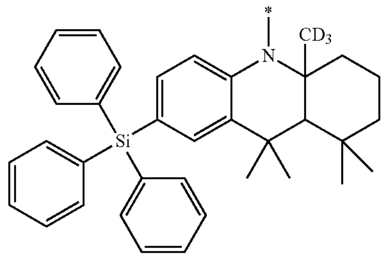
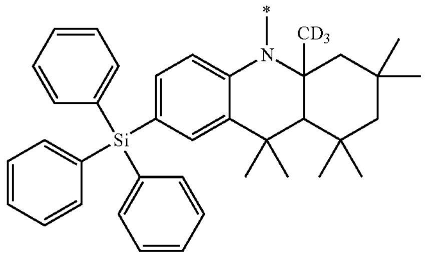
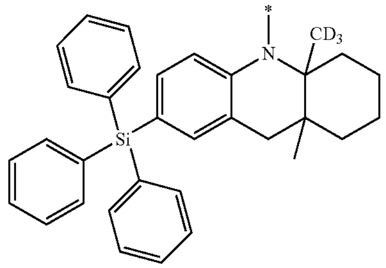
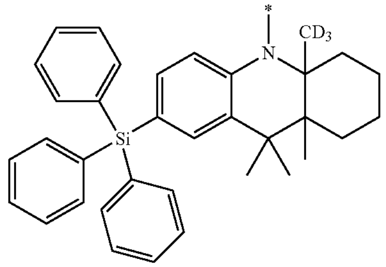
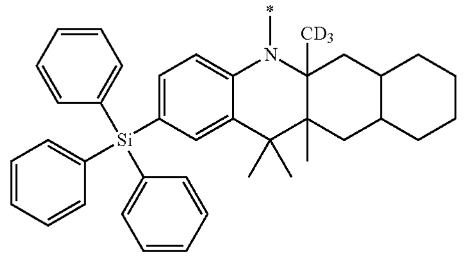

-continued
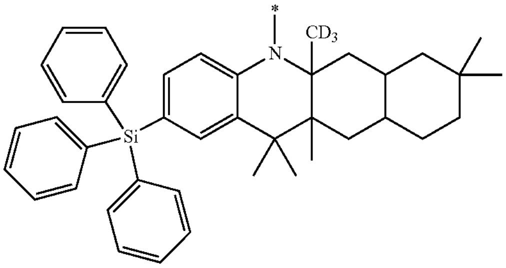
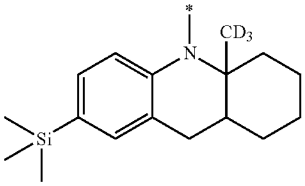
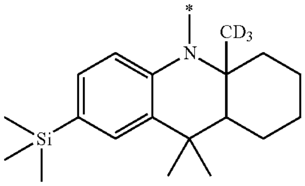
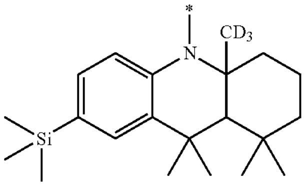
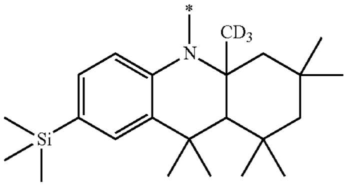
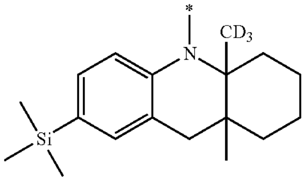
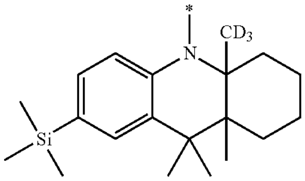
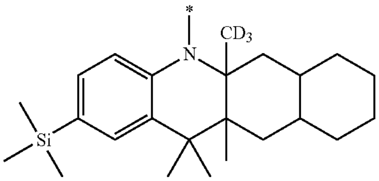
-continued
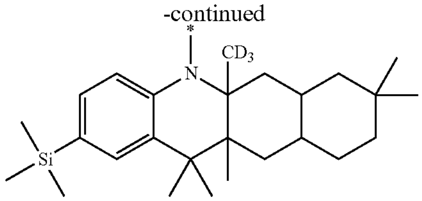
In an exemplary embodiment of the present specification, Formula 1 is represented by any one of the following compounds.
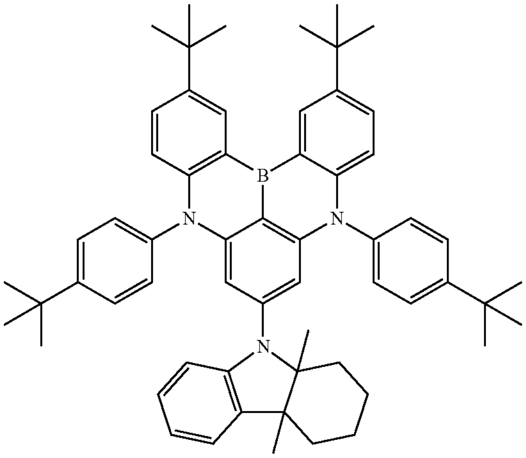
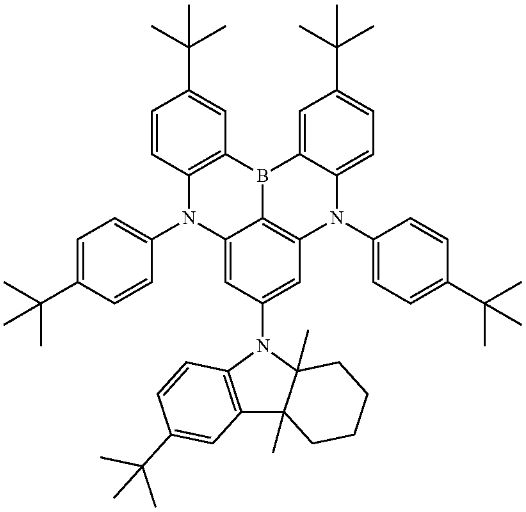

-continued
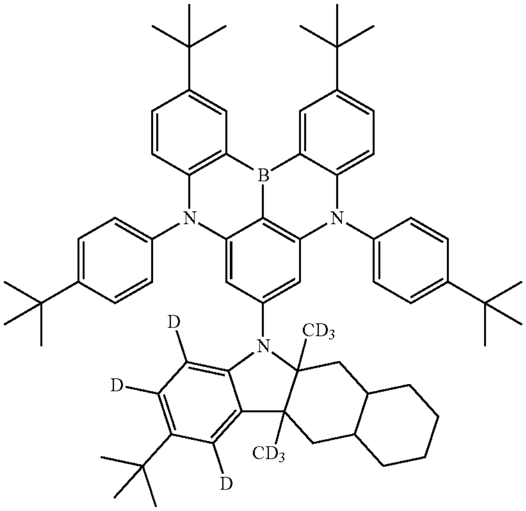
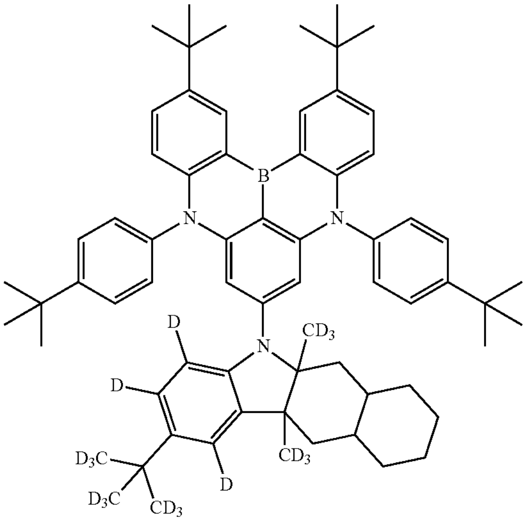
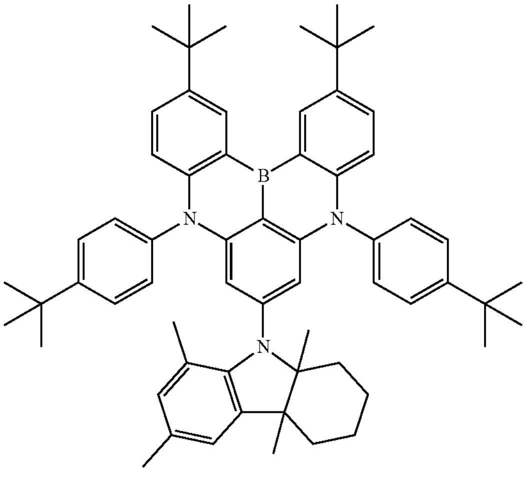
-continued
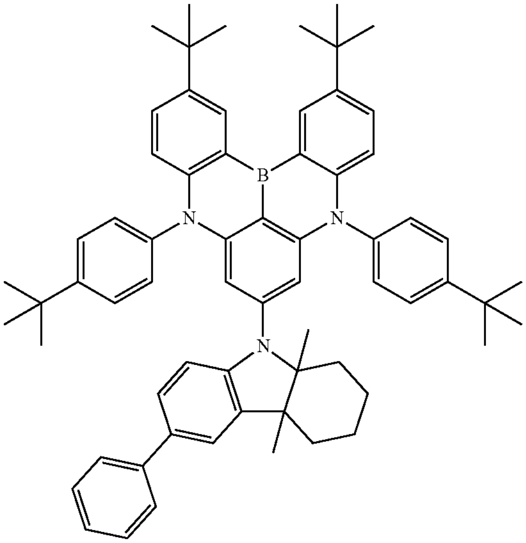
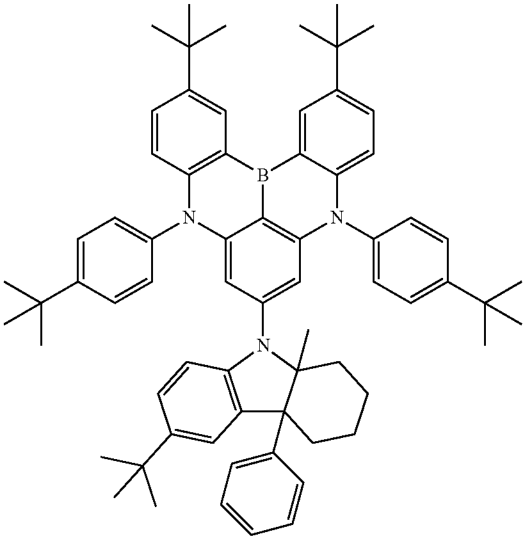
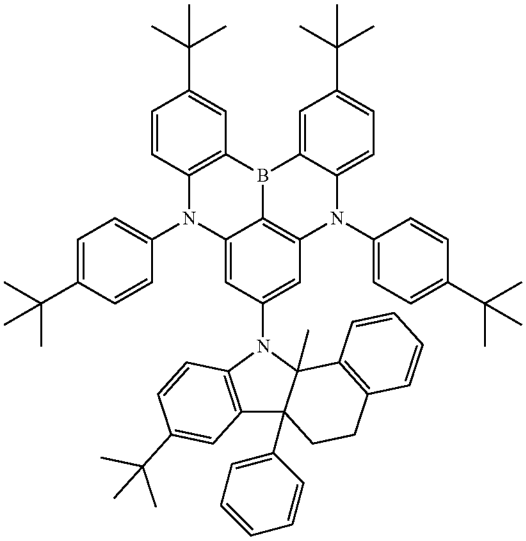

-continued
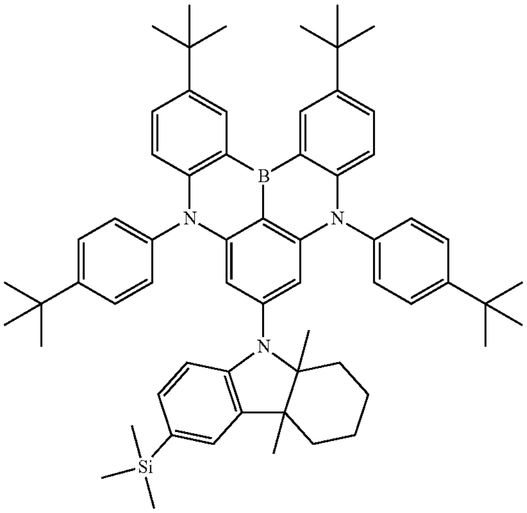
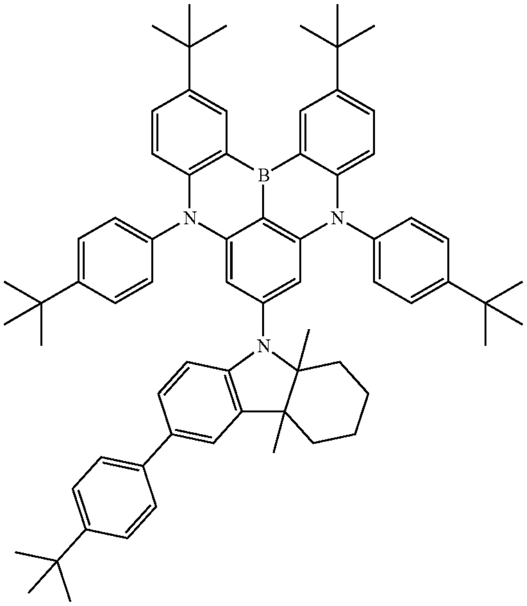
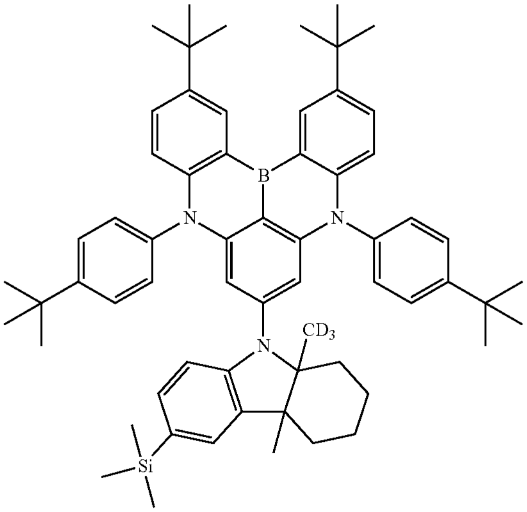
-continued
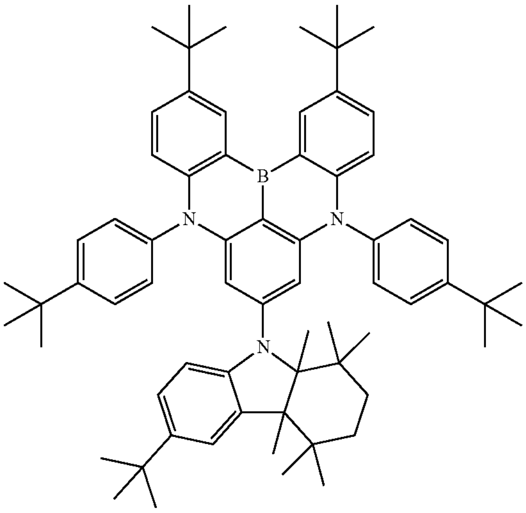
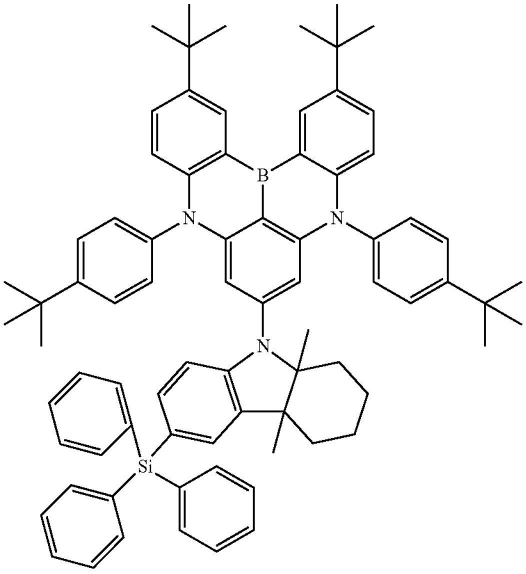
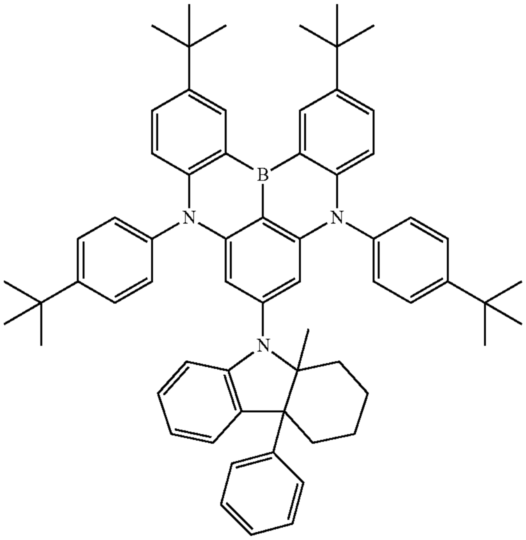

-continued
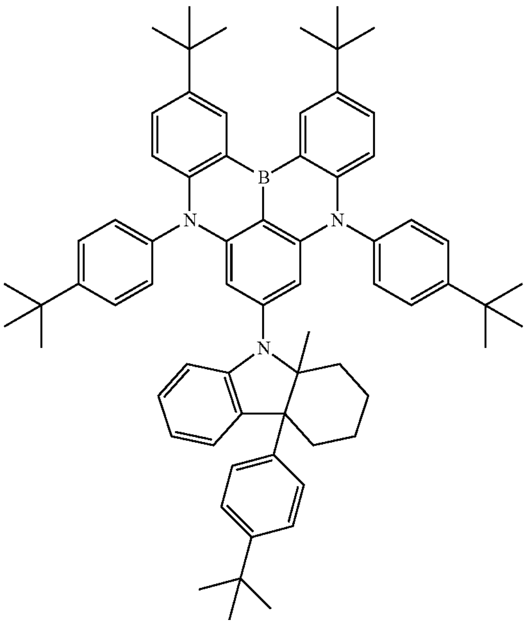
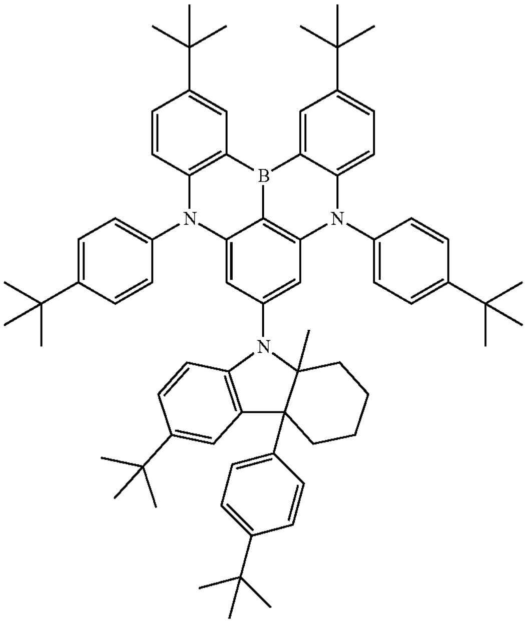
-continued
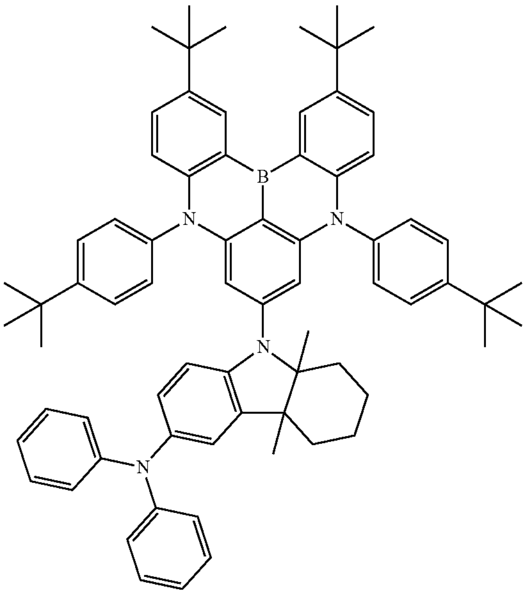
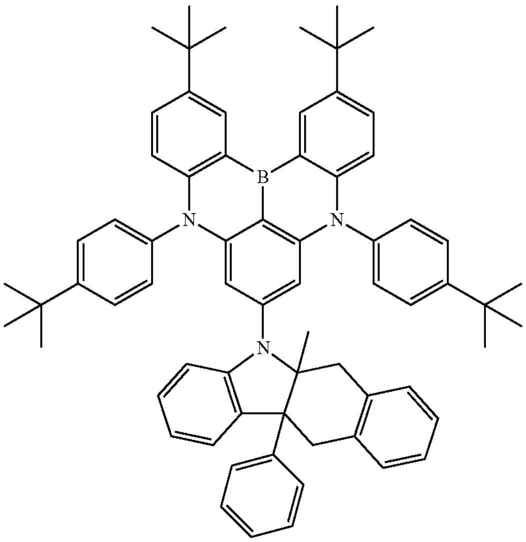
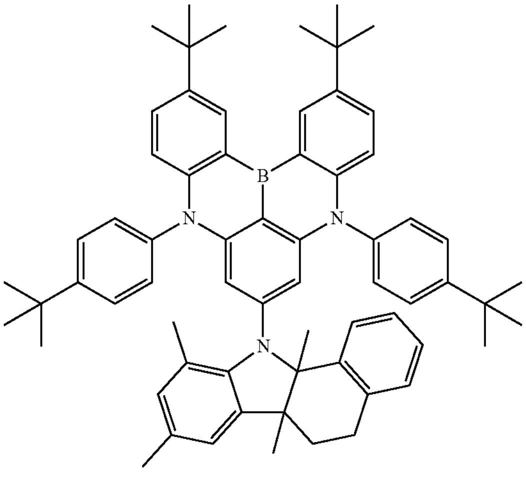

-continued
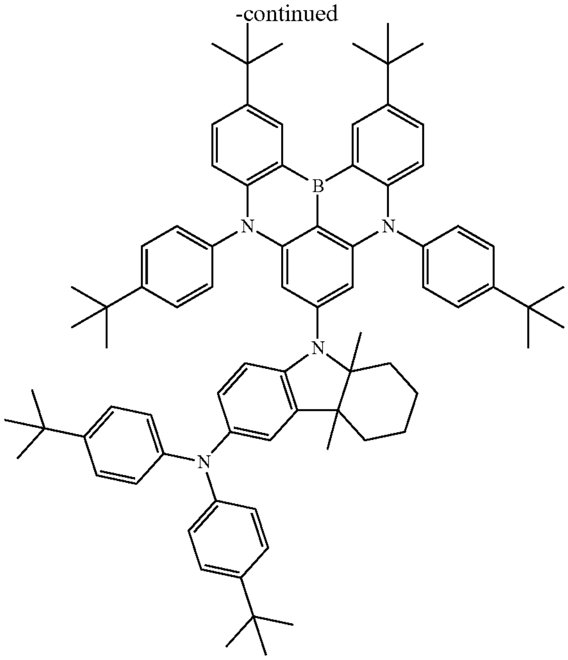
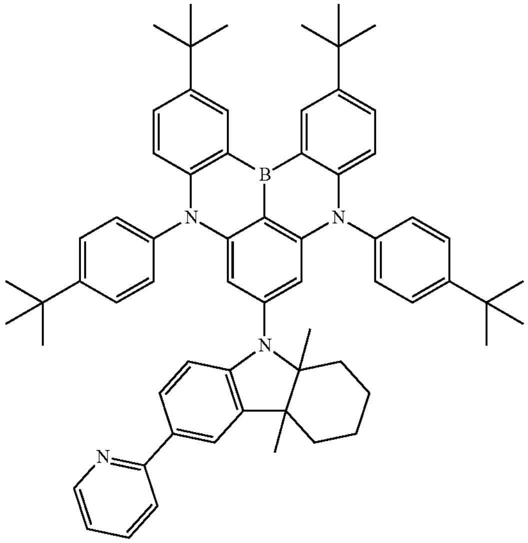
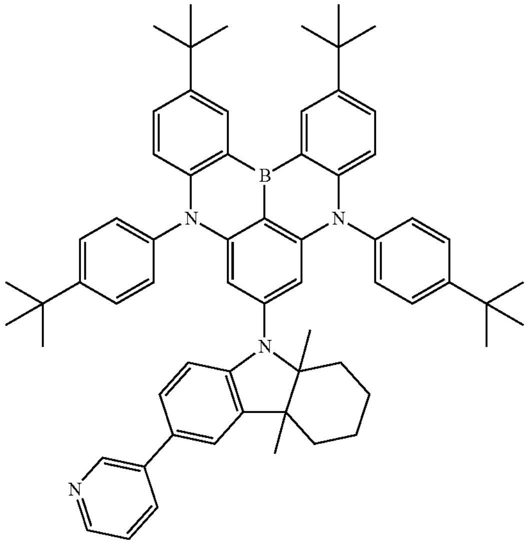
-continued
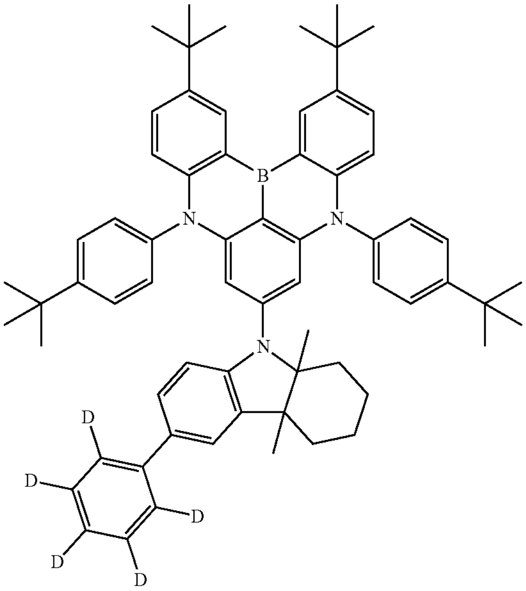
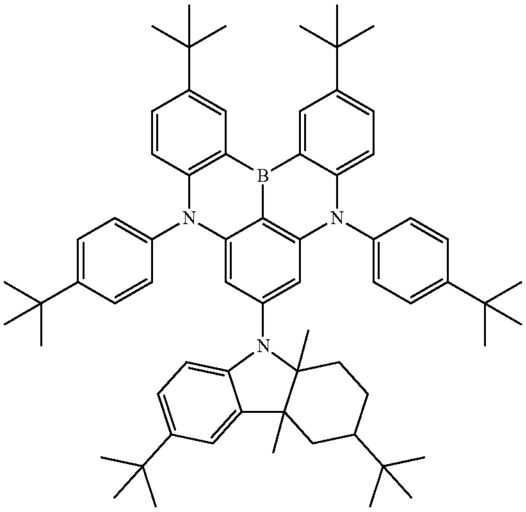
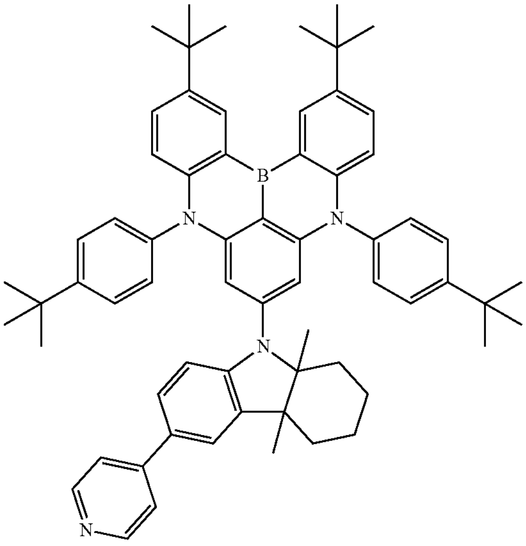

-continued
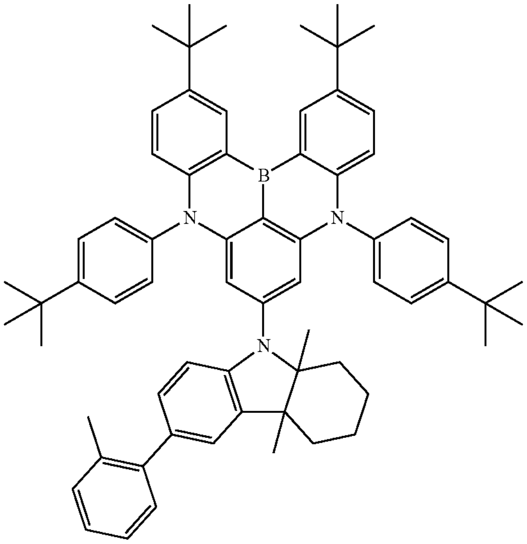
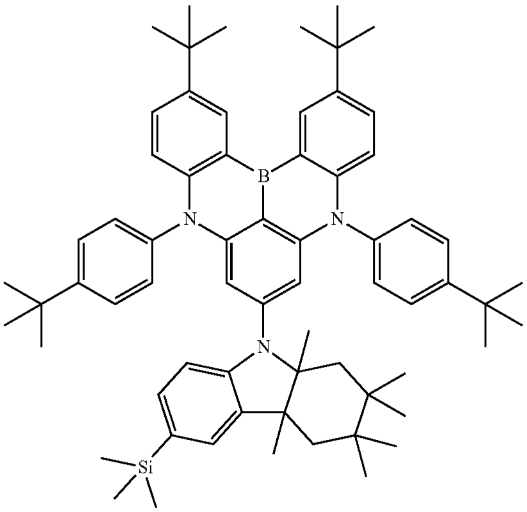
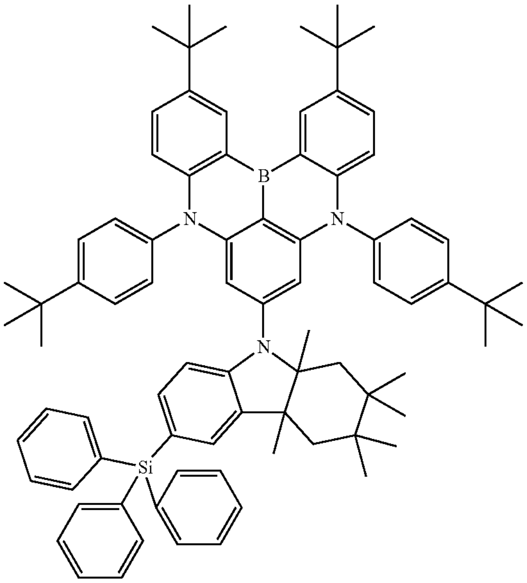
-continued
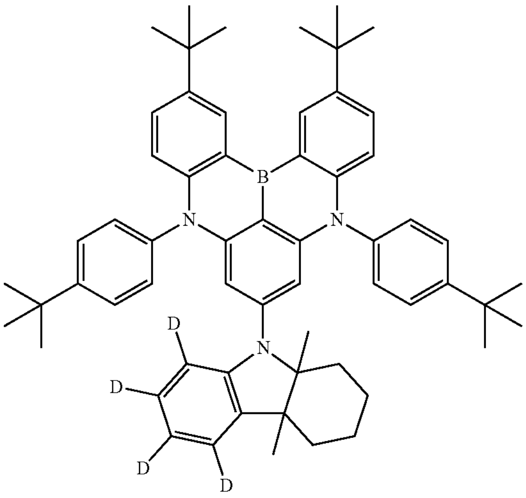
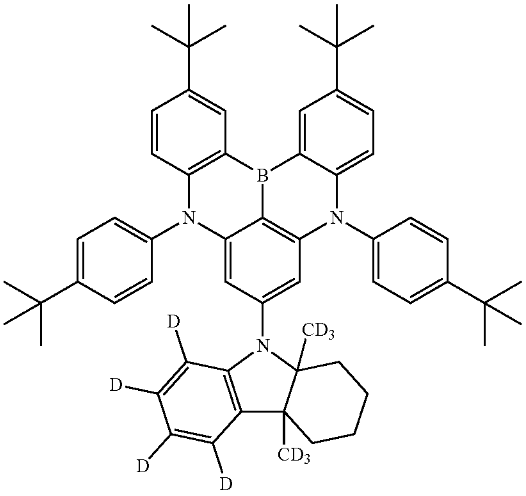
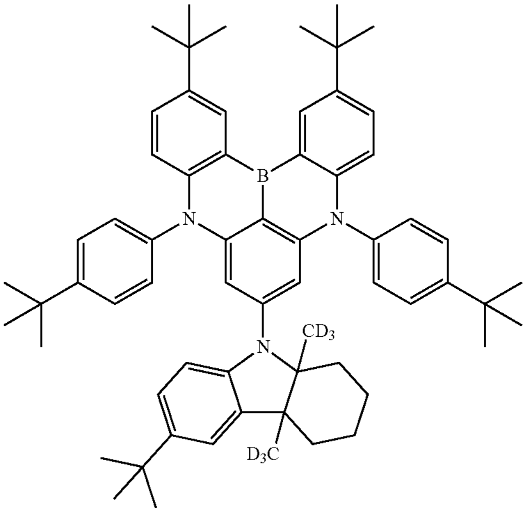

-continued
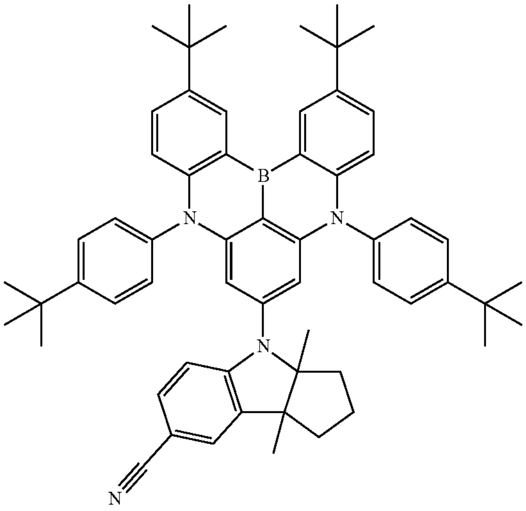
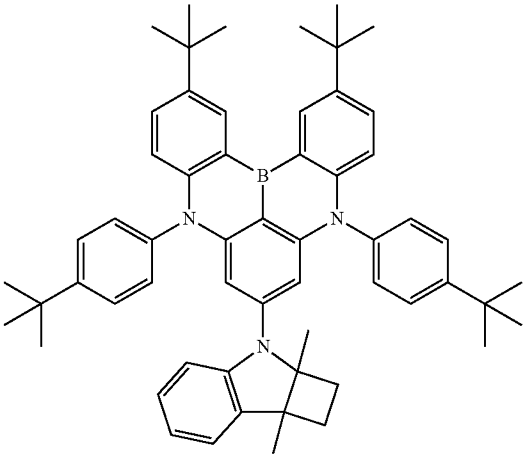
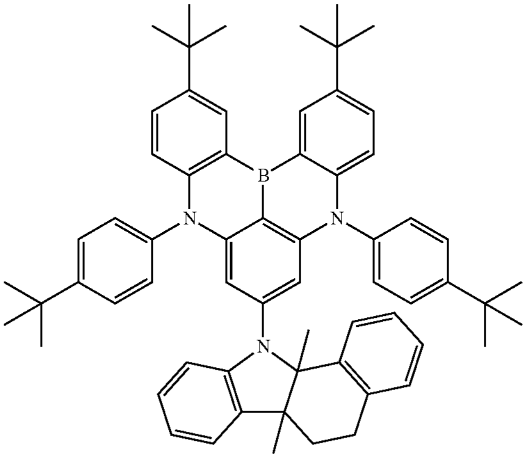
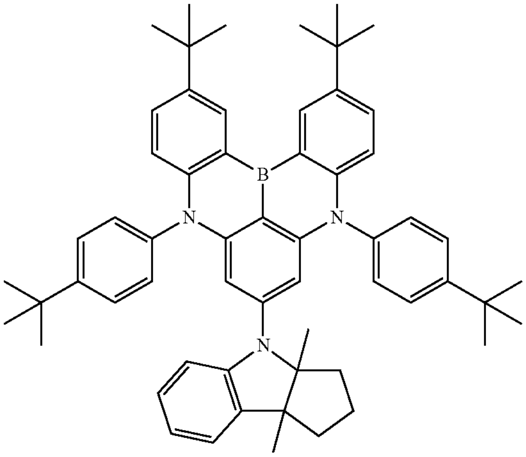
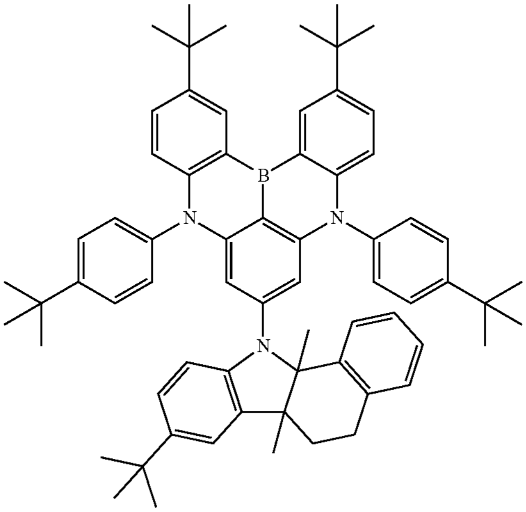
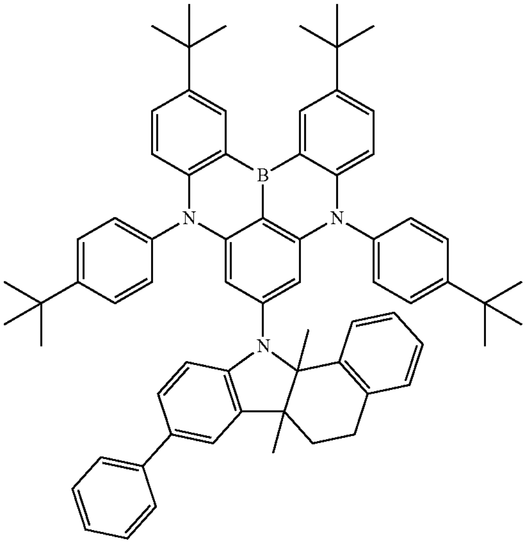
-continued

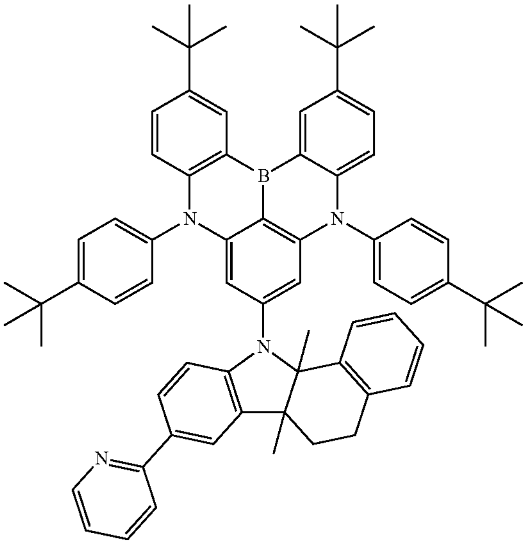
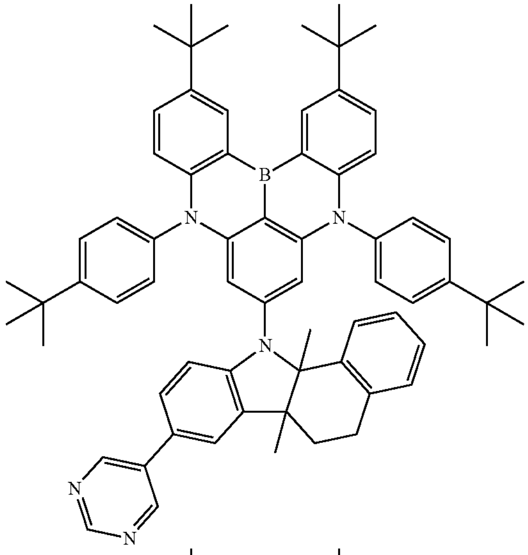
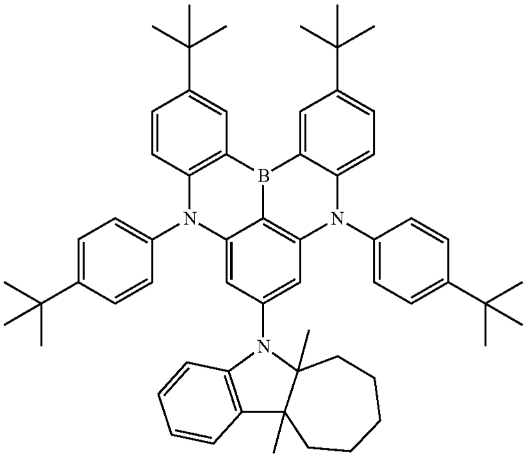
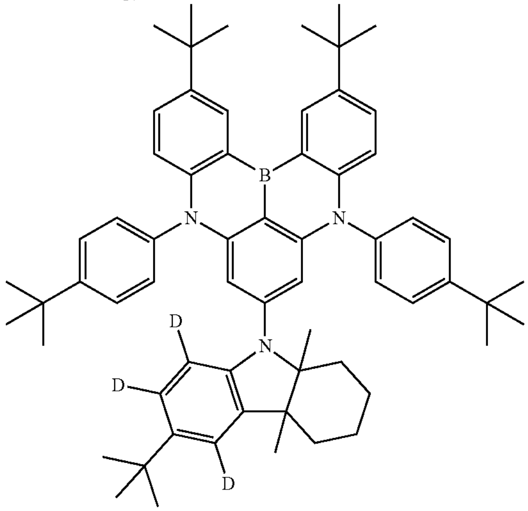
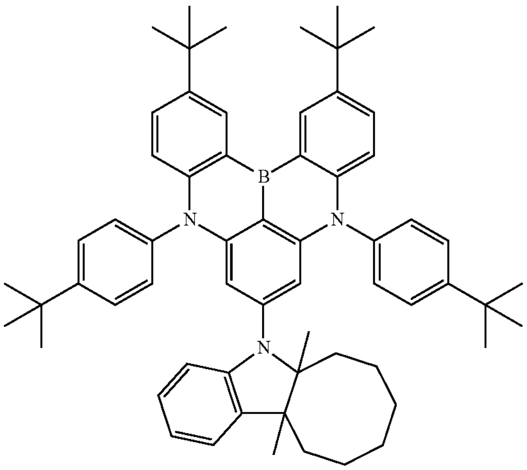
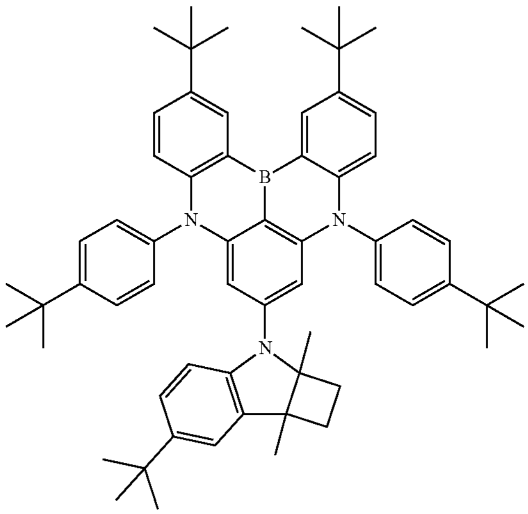

-continued
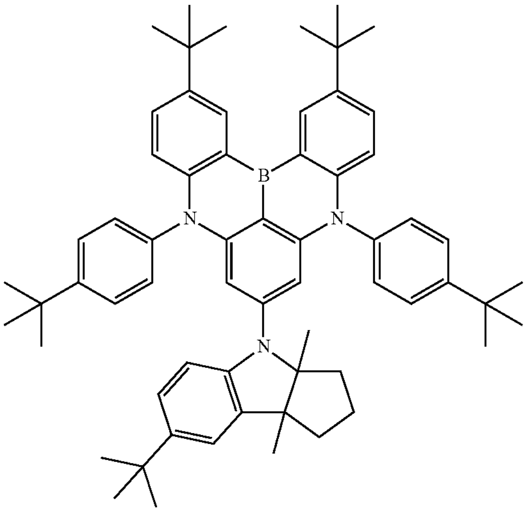
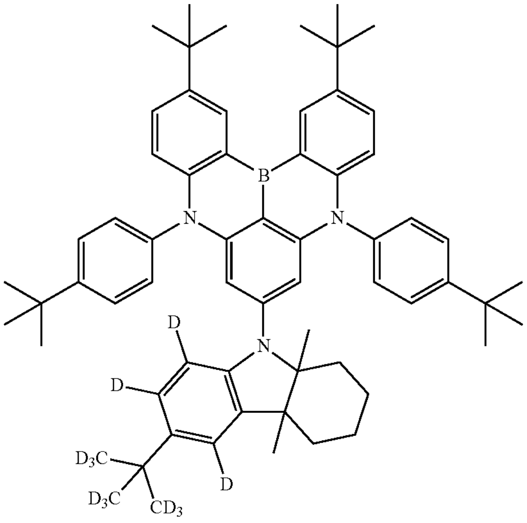
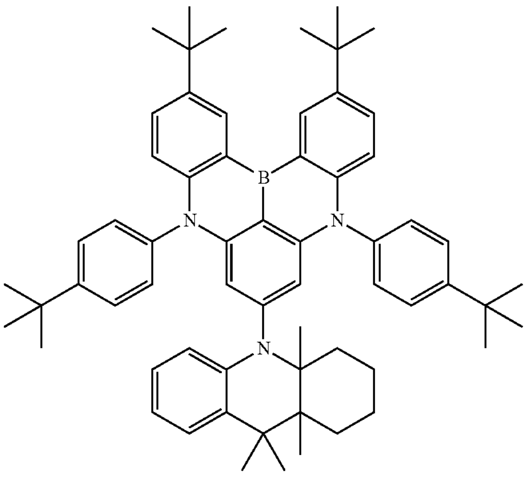
-continued
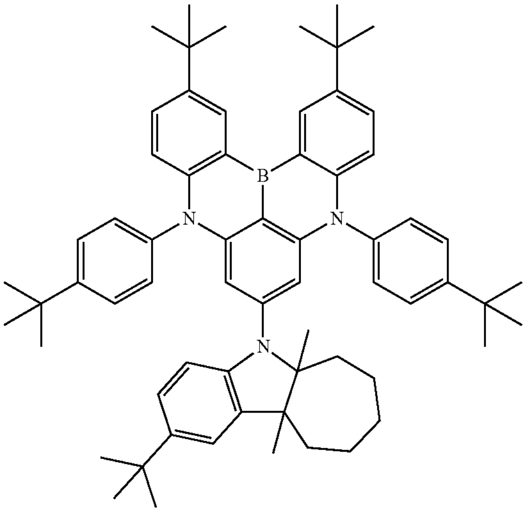
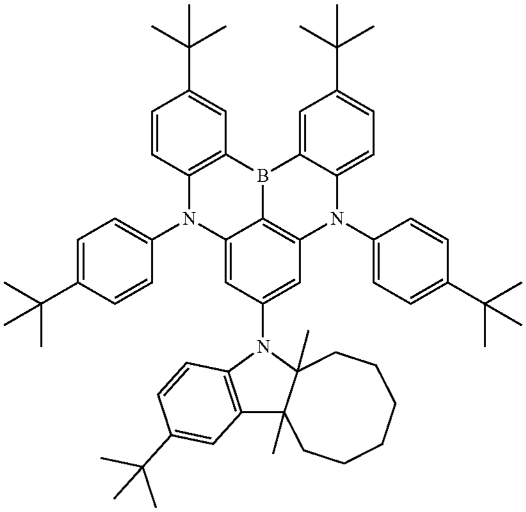
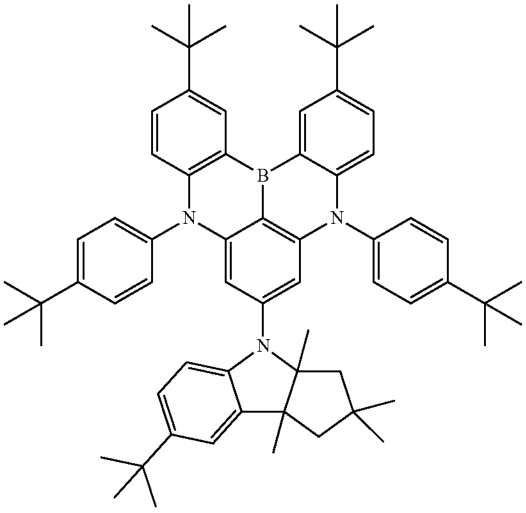

-continued
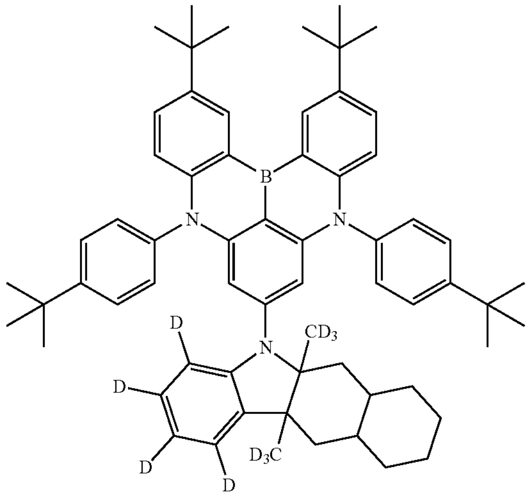
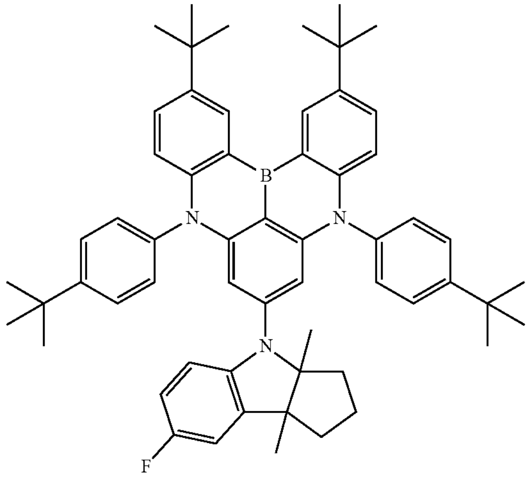
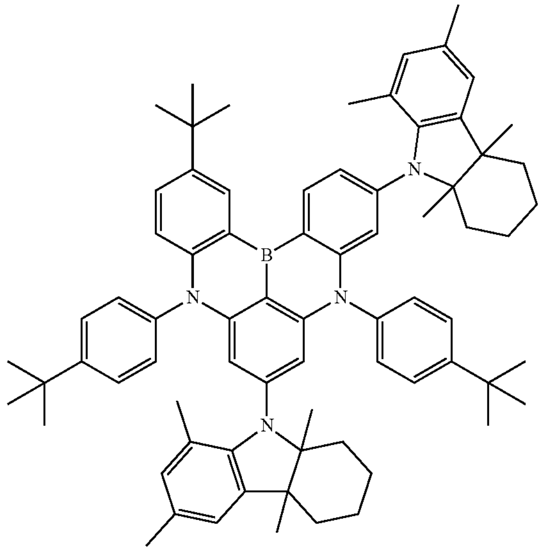
-continued
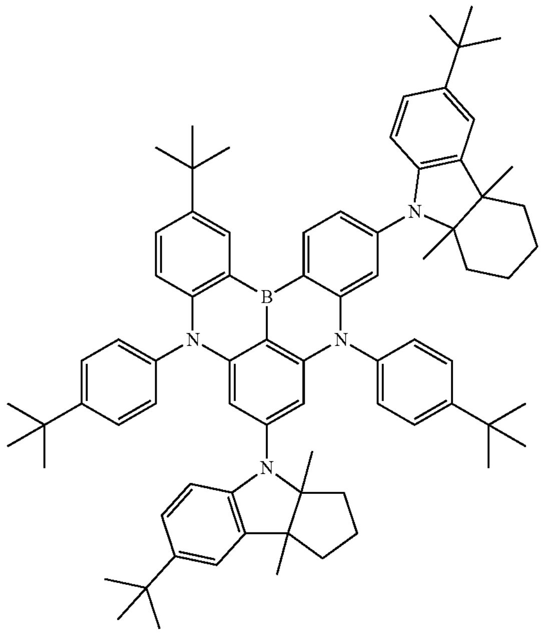
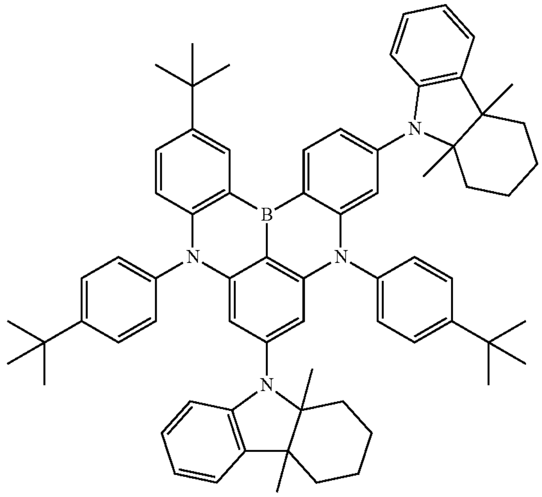
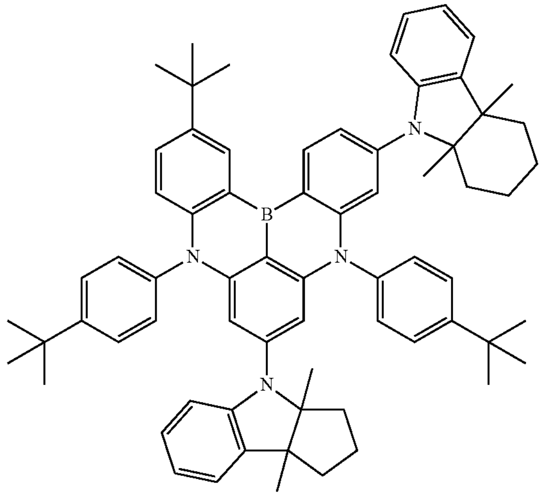

-continued
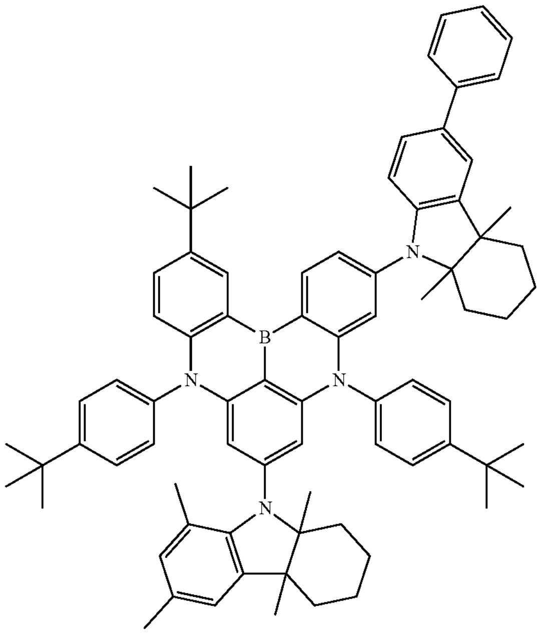
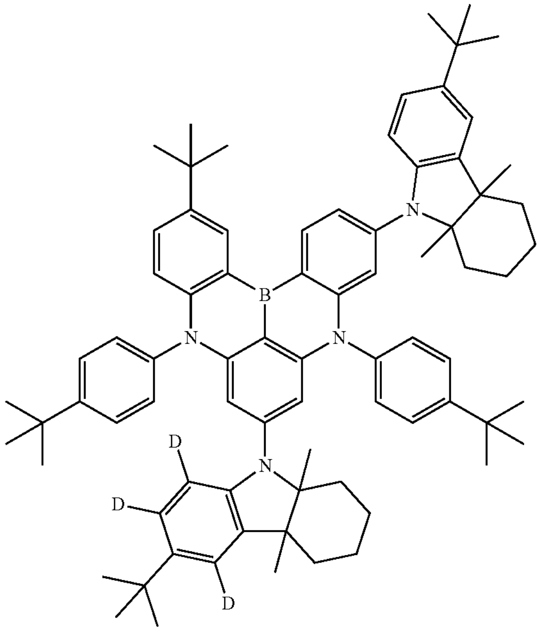
-continued
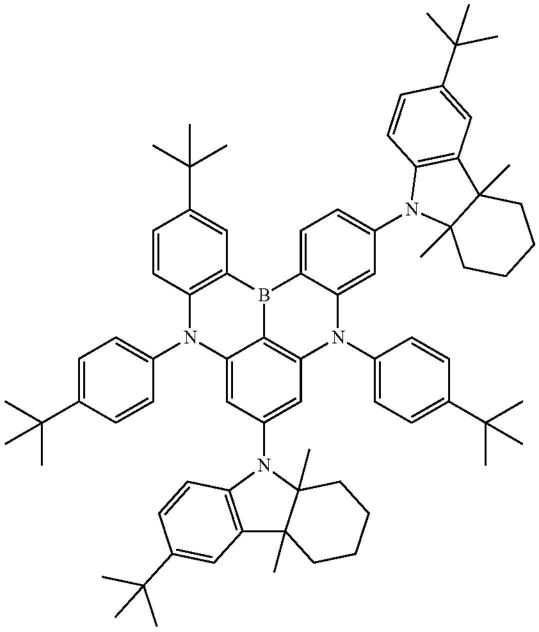
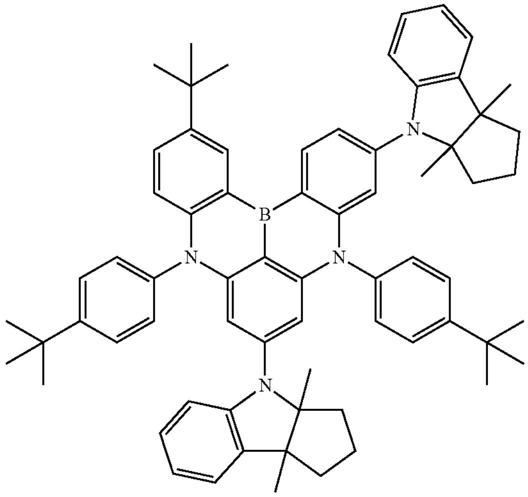

-continued
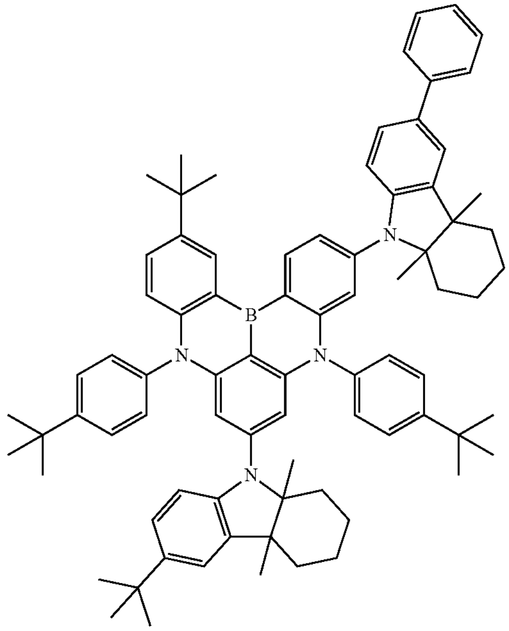
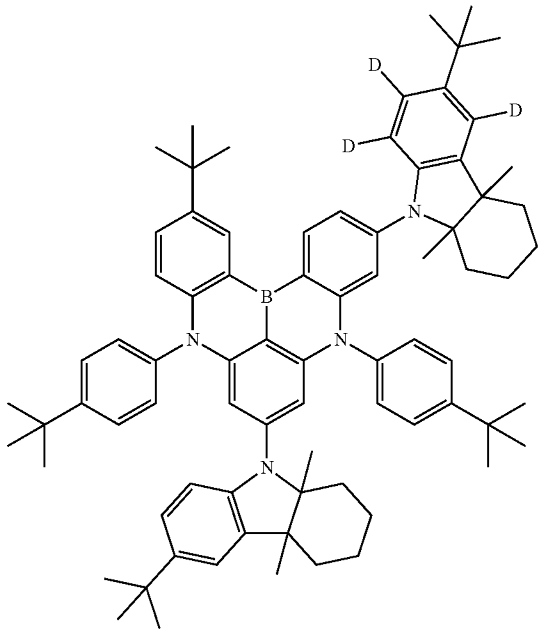
-continued
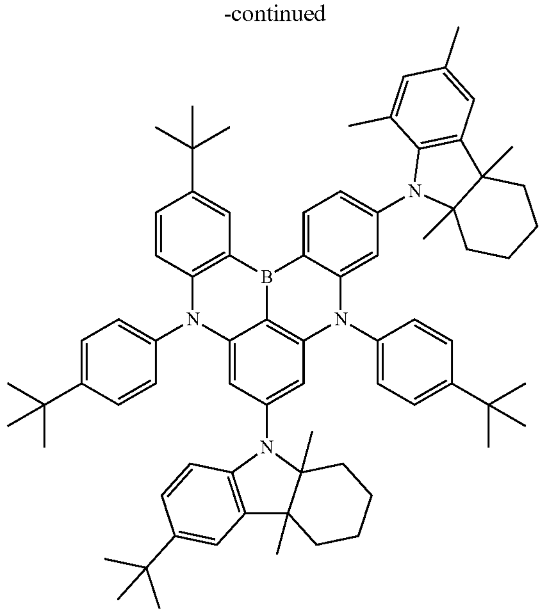
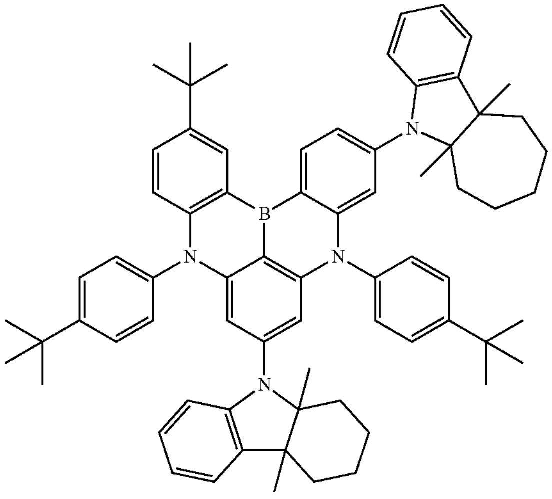
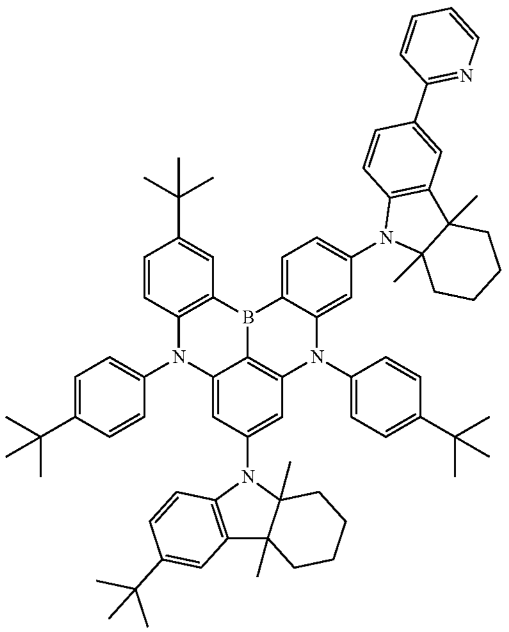

-continued
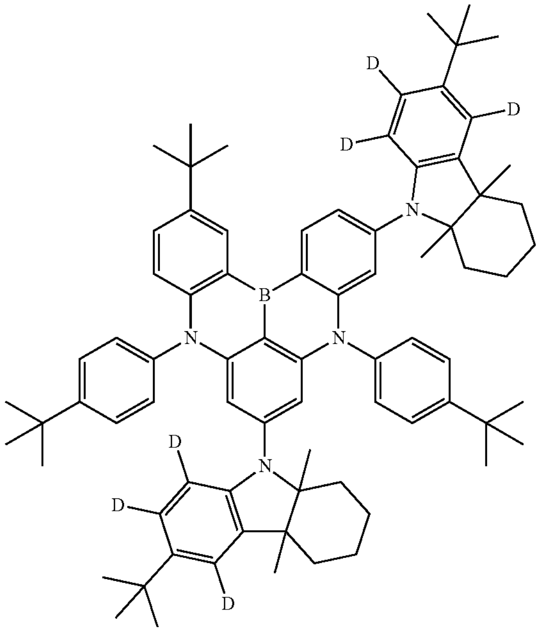
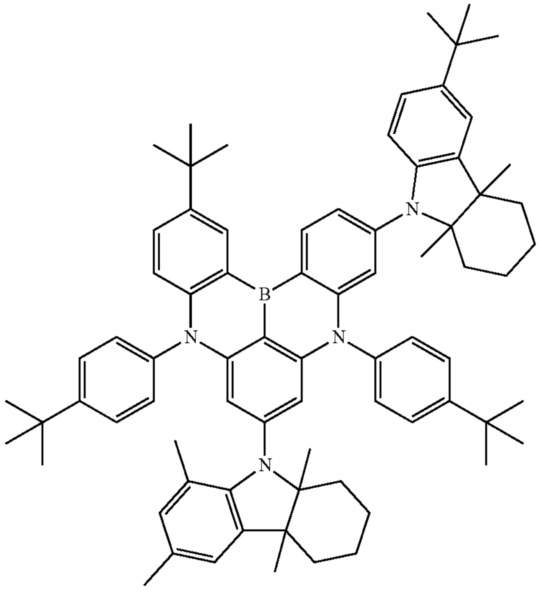
-continued
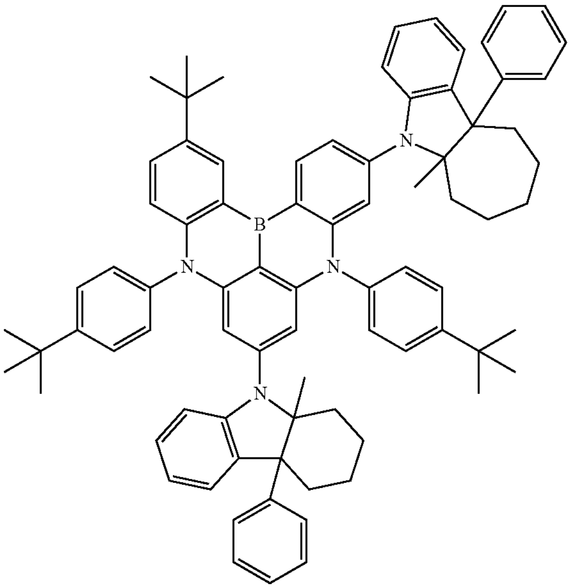
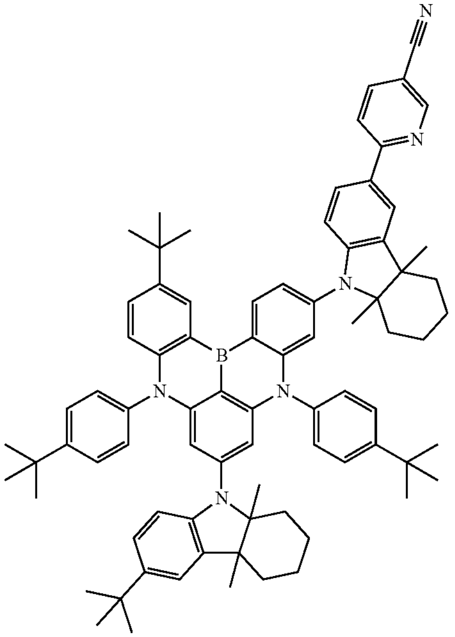

-continued
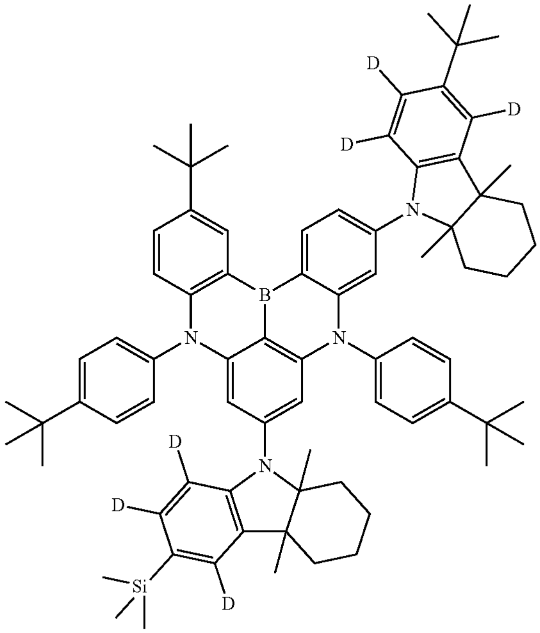
-continued
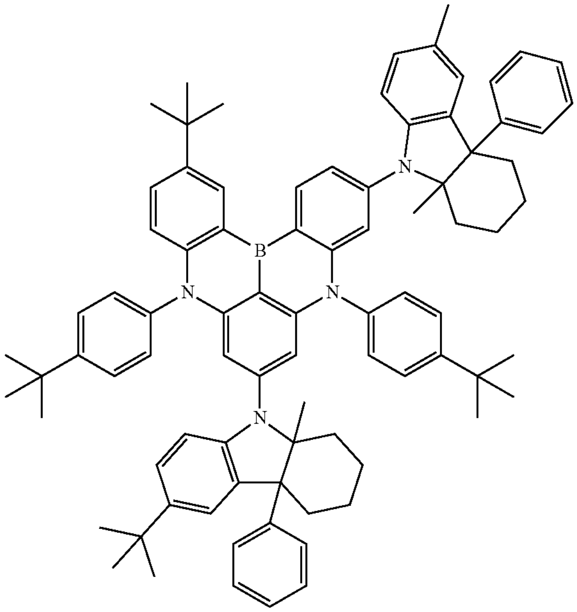
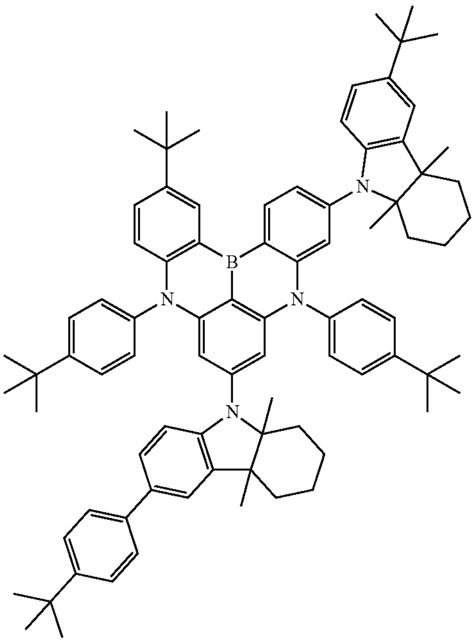
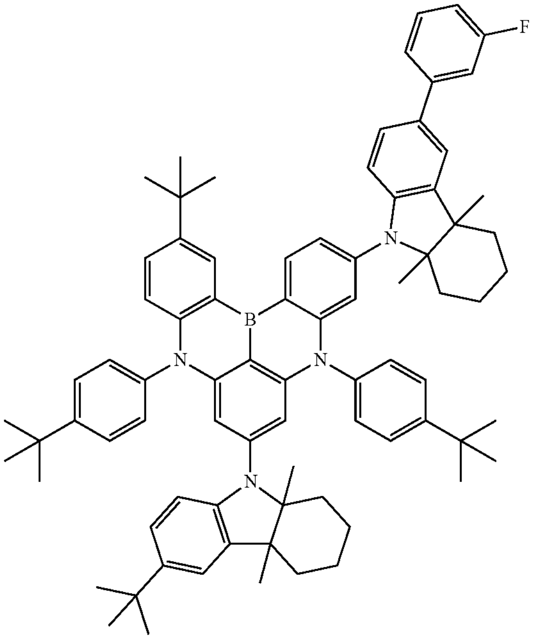

-continued
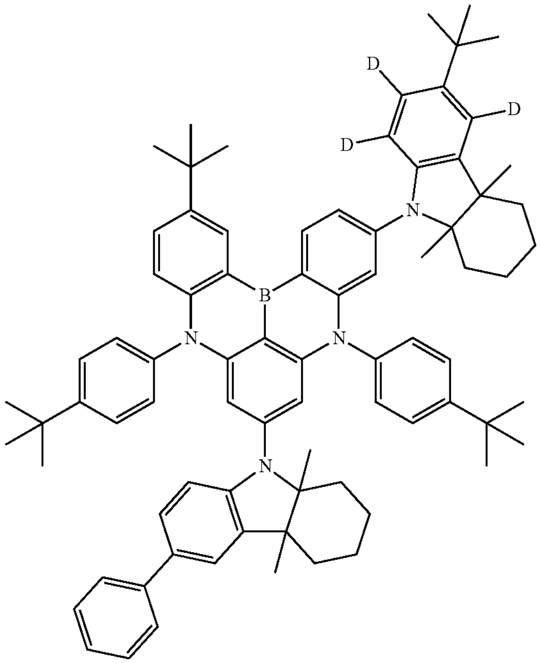
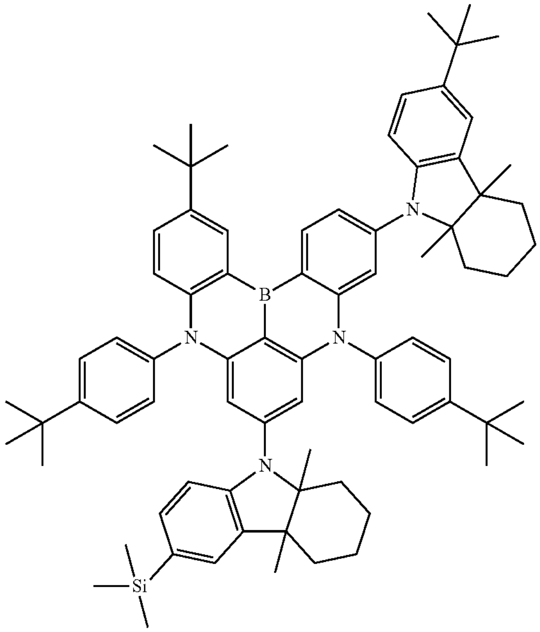
-continued
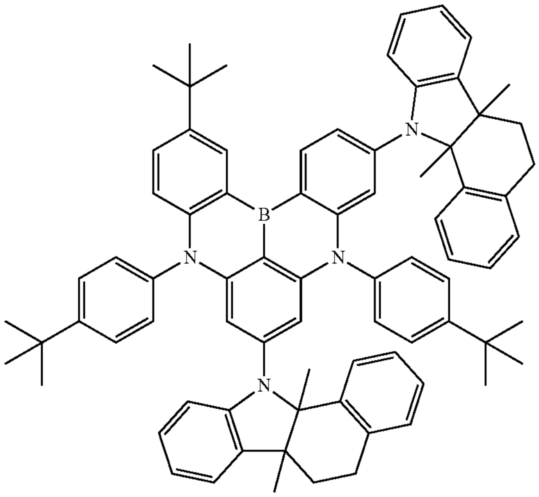
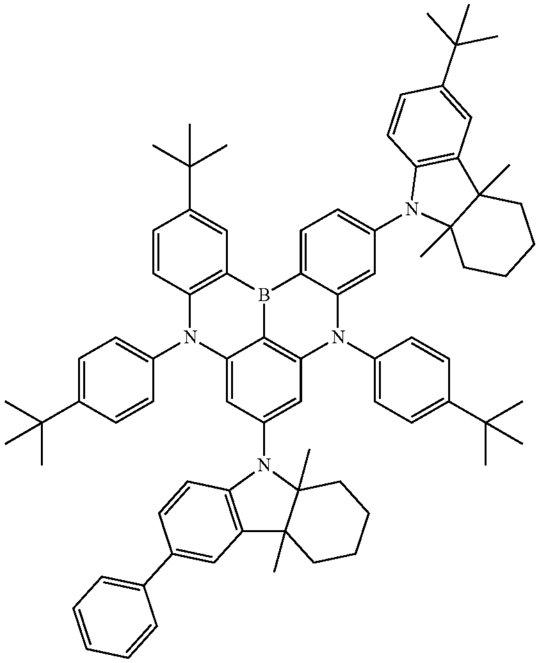

-continued
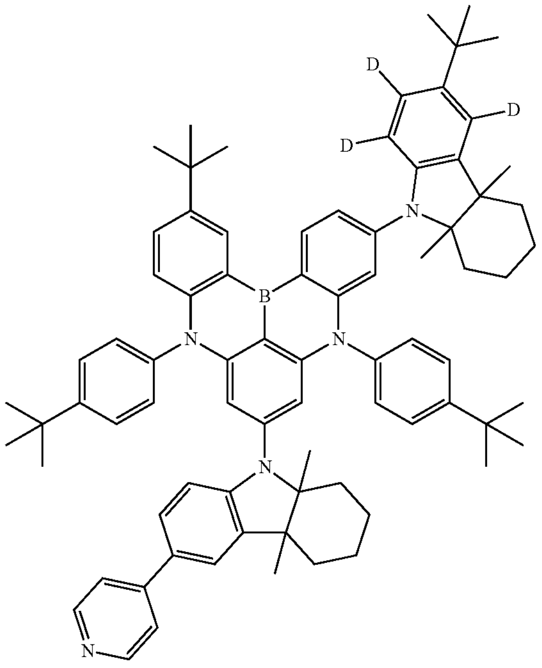
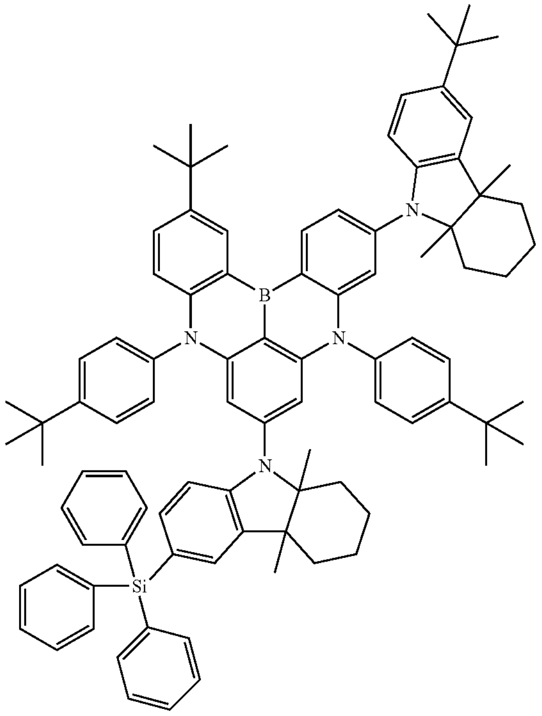
-continued
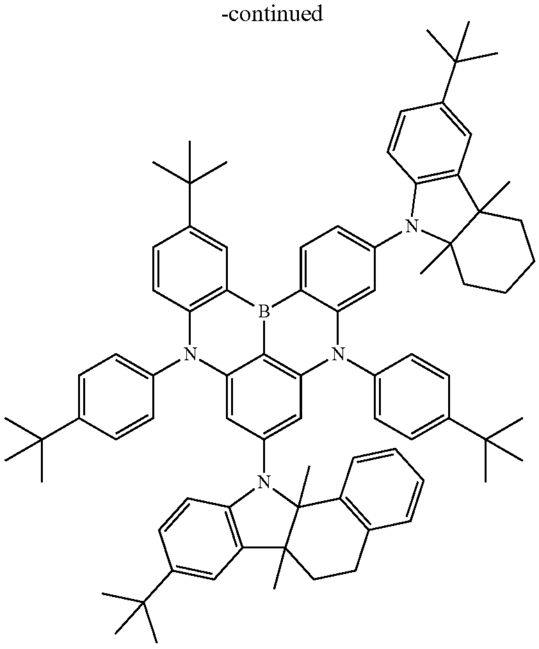
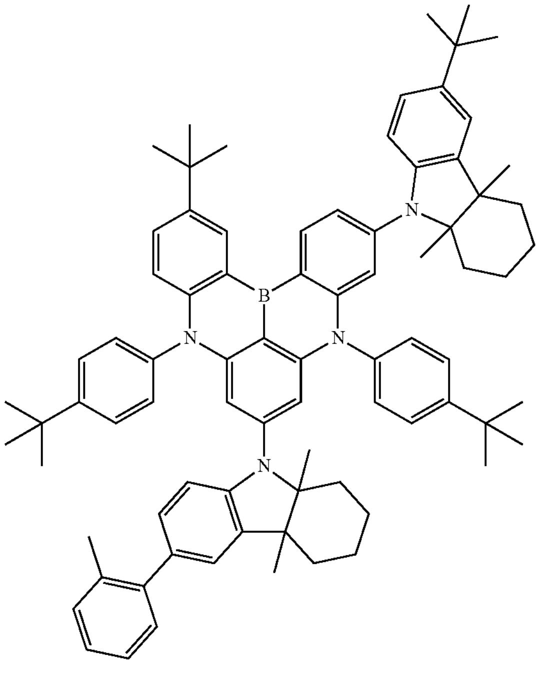

-continued
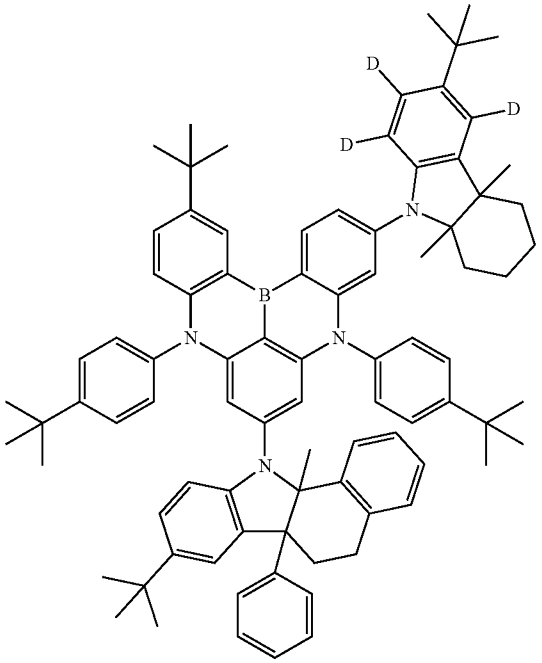
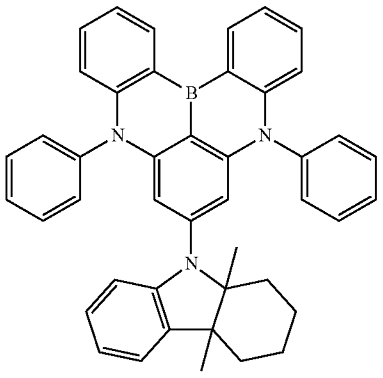
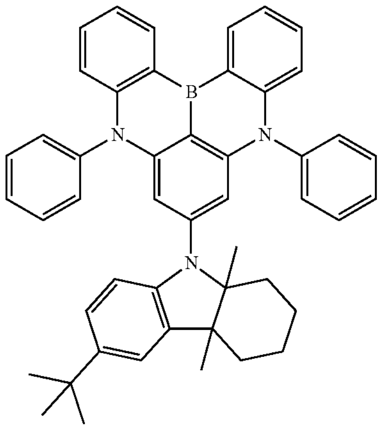
-continued
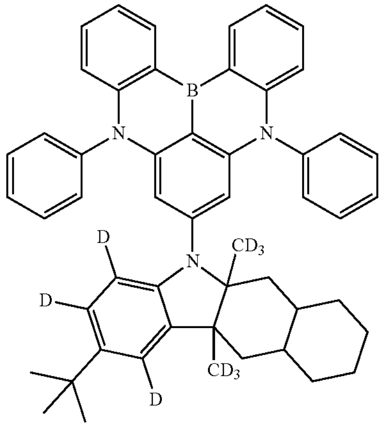
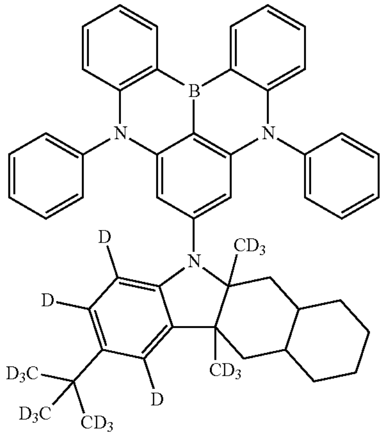
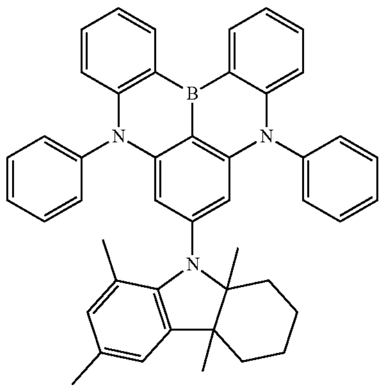
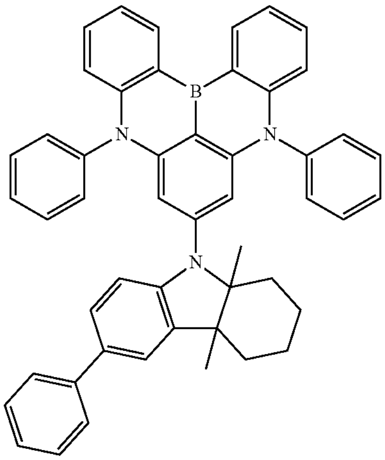

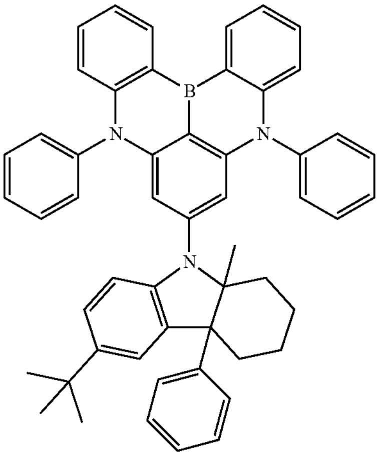
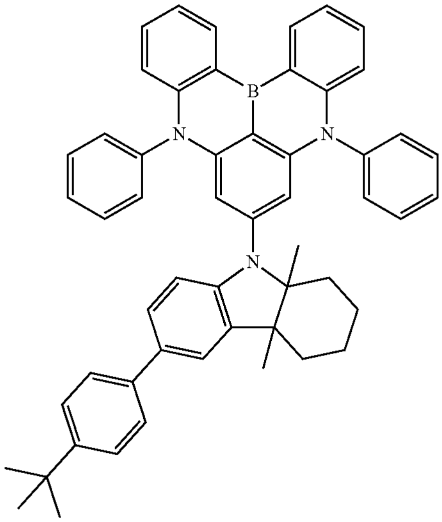
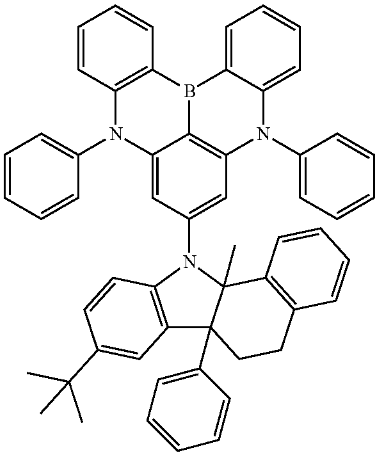
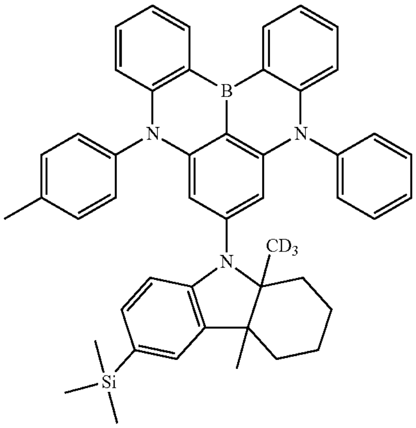
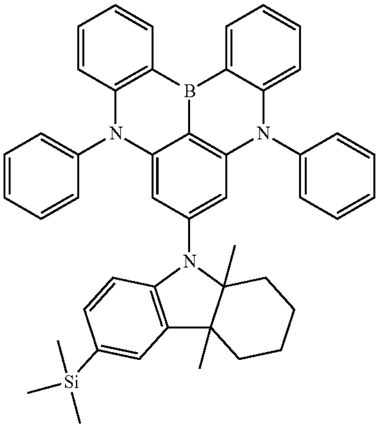
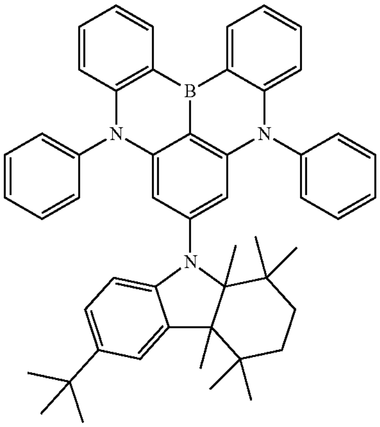

-continued
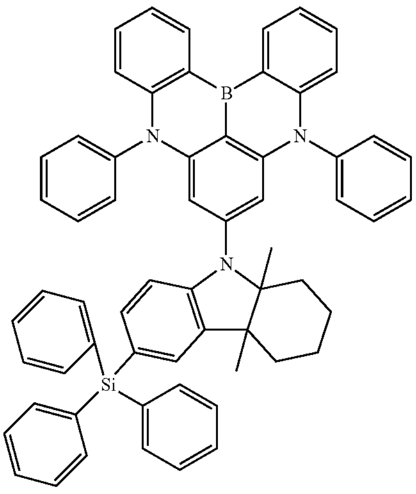
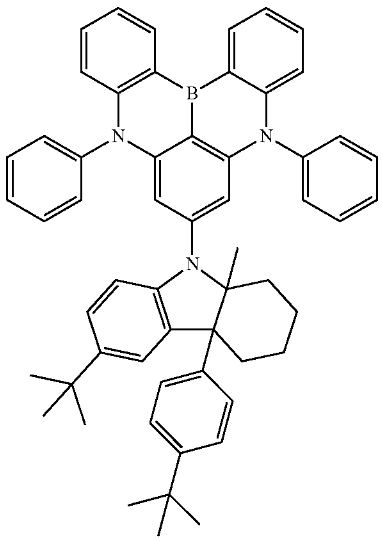
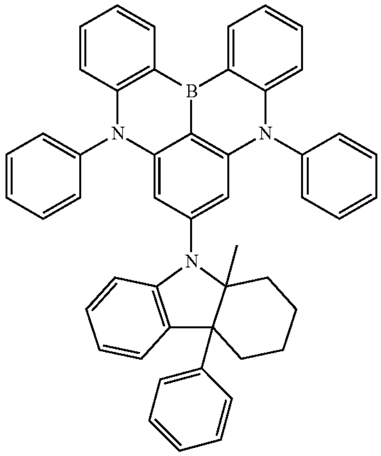
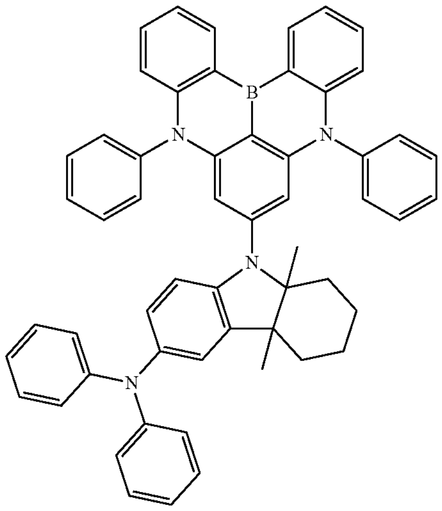
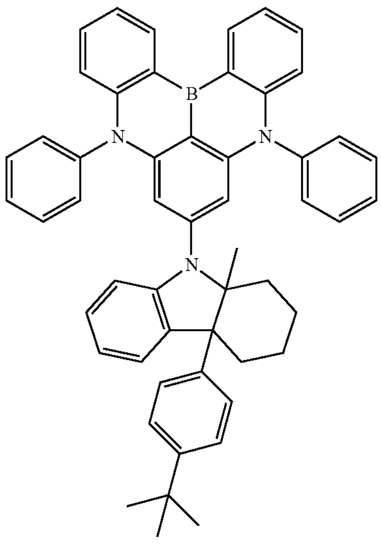
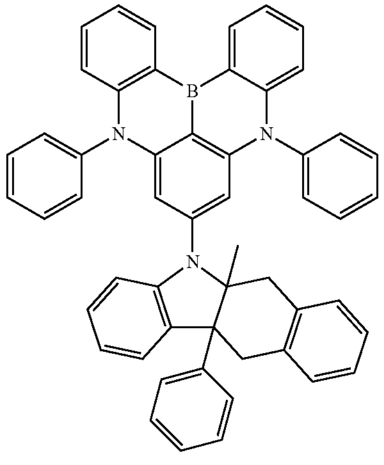
-continued -continued
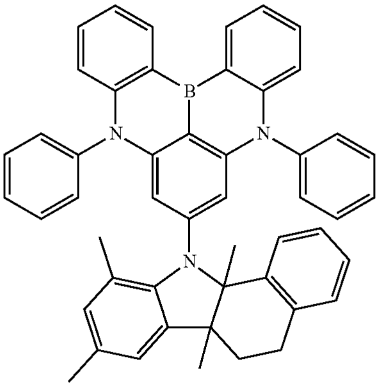
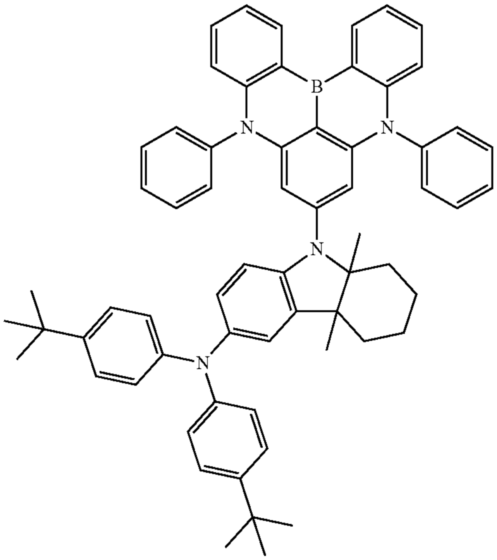
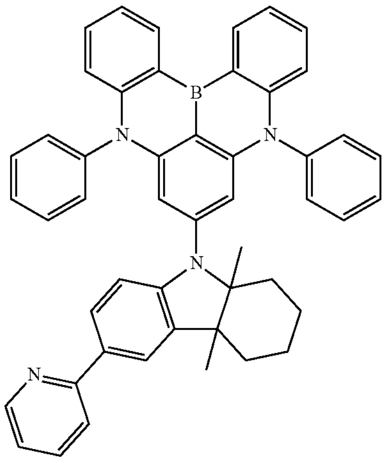
-continued
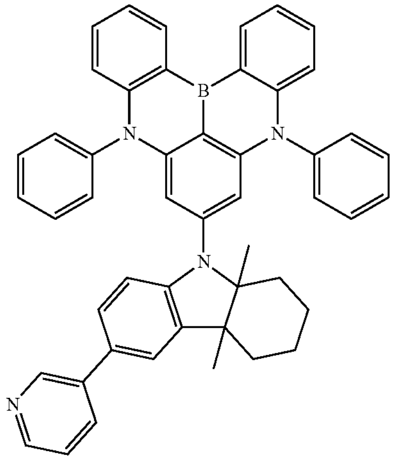
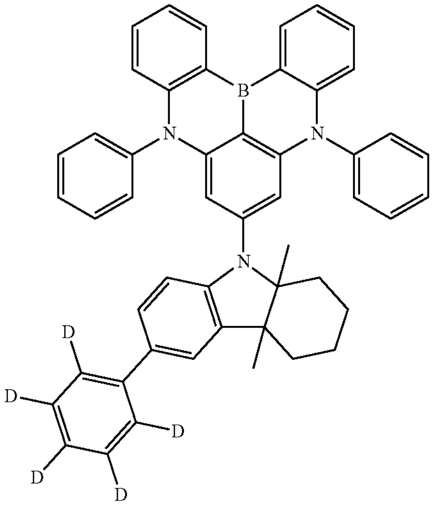
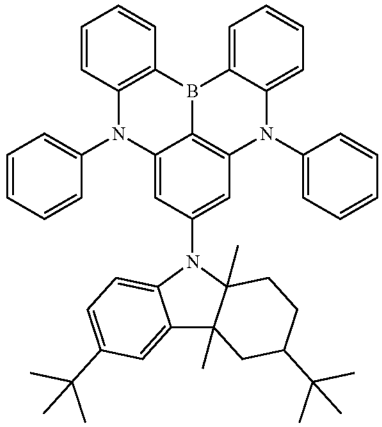

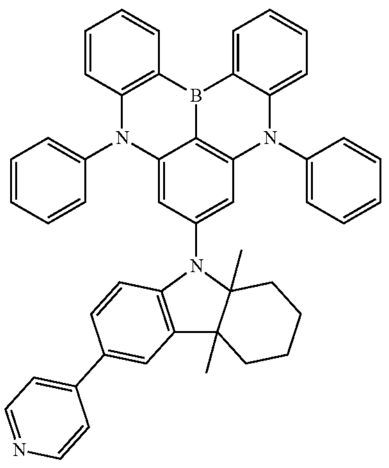
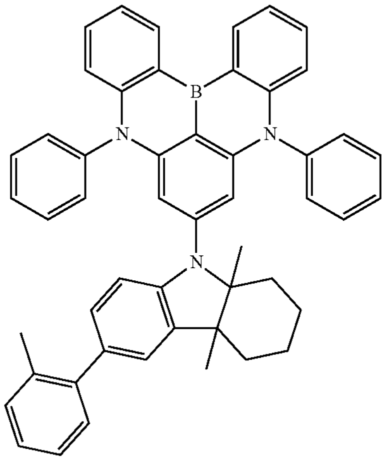
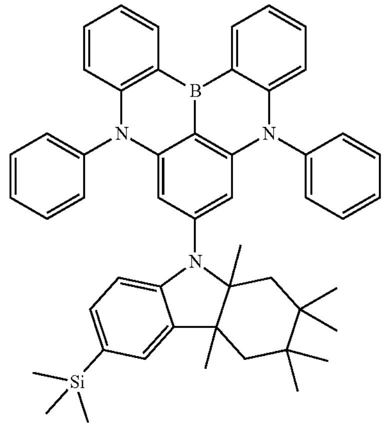
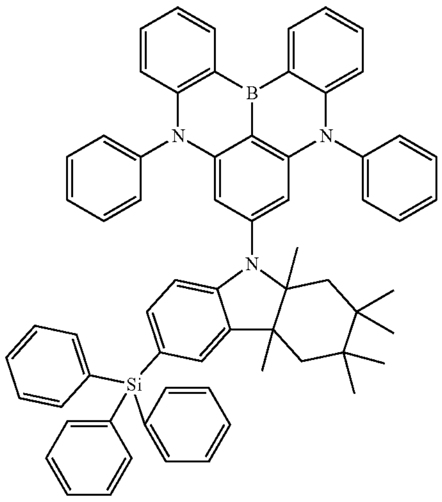
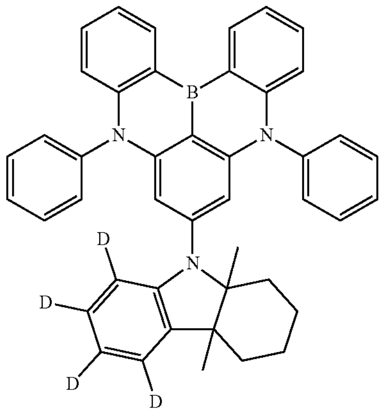
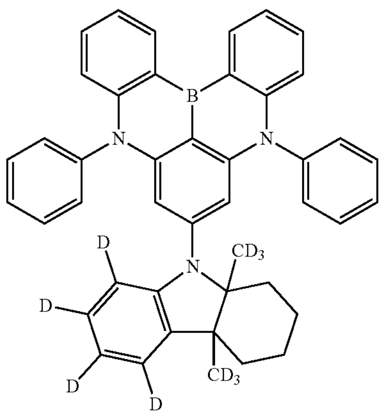

-continued
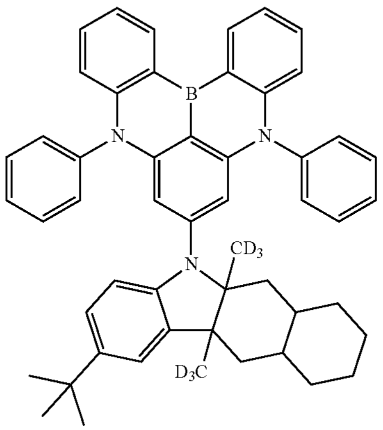
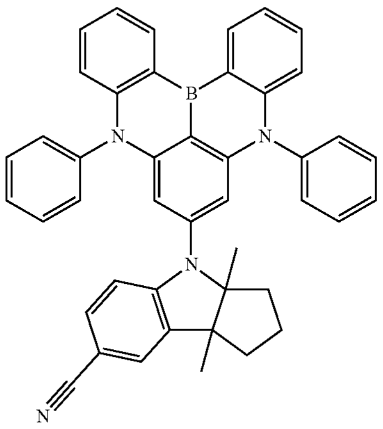
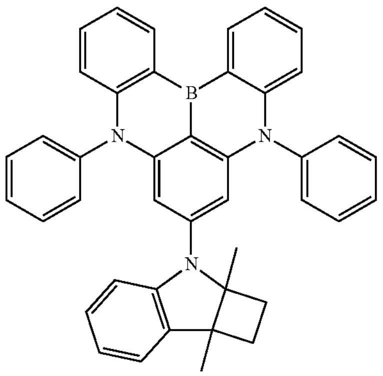
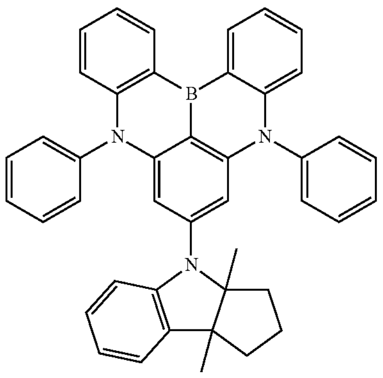
-continued
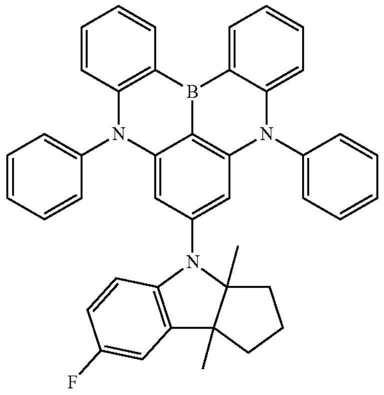
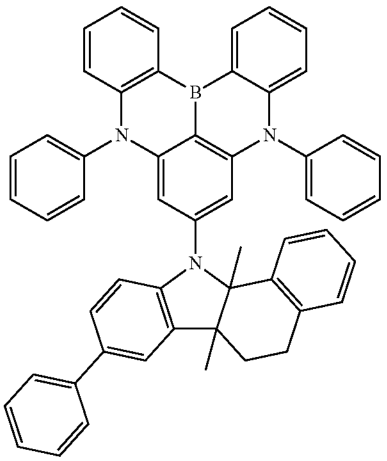
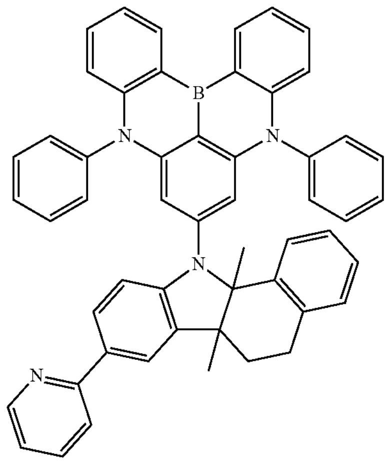
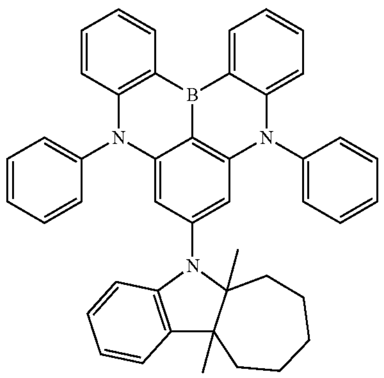

-continued
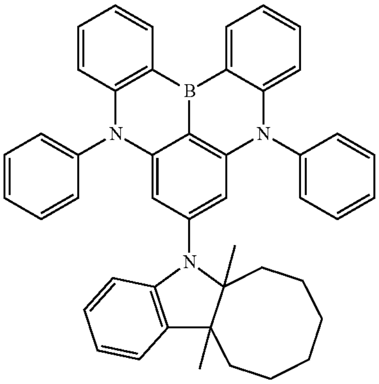
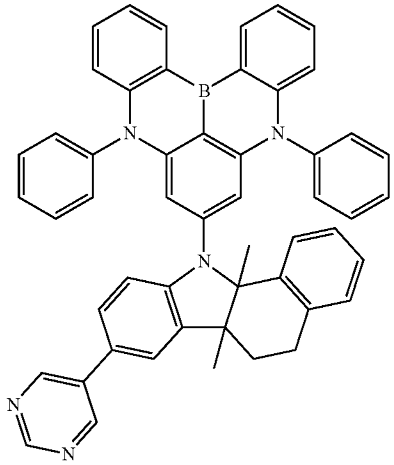
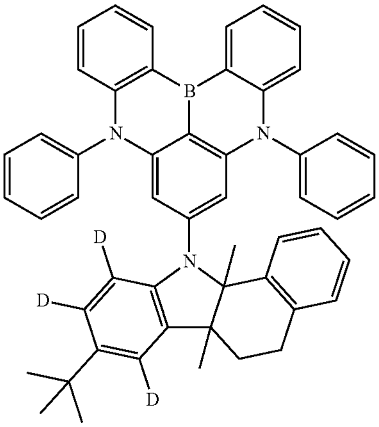
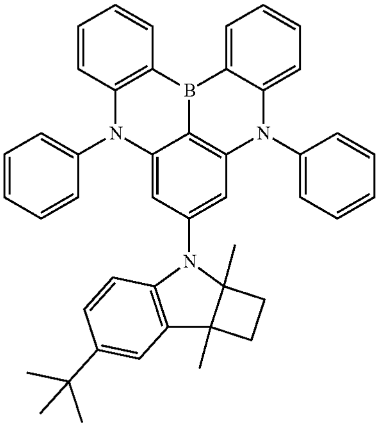
-continued
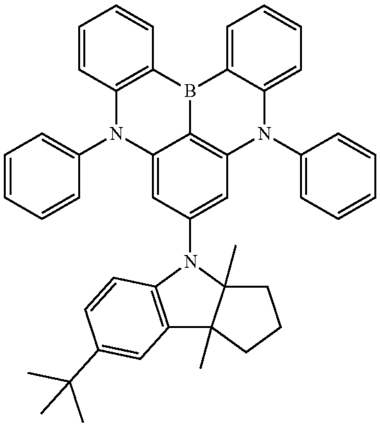
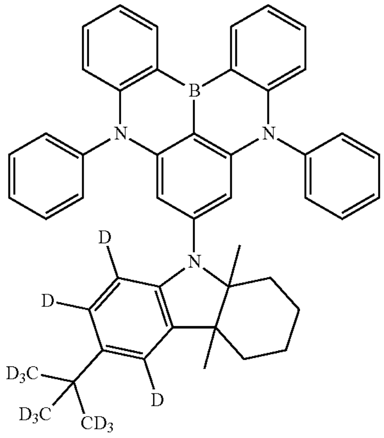
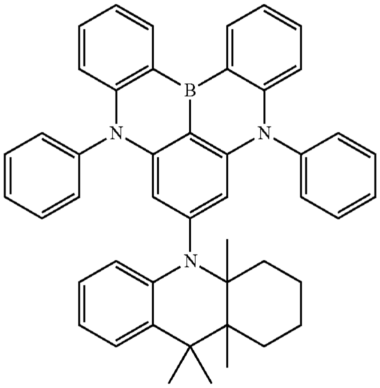
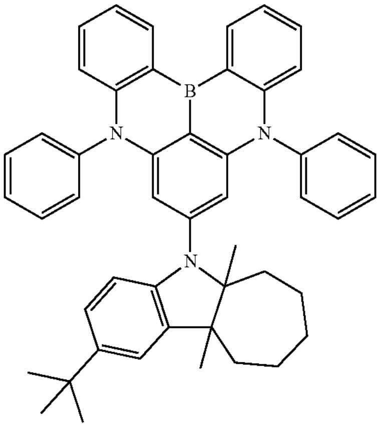

-continued
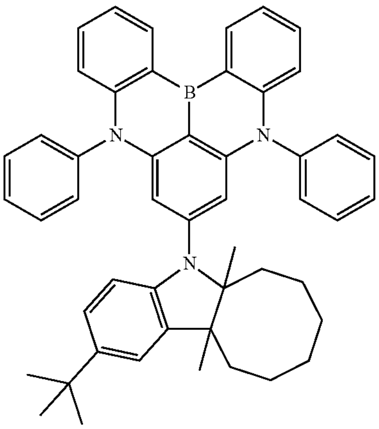
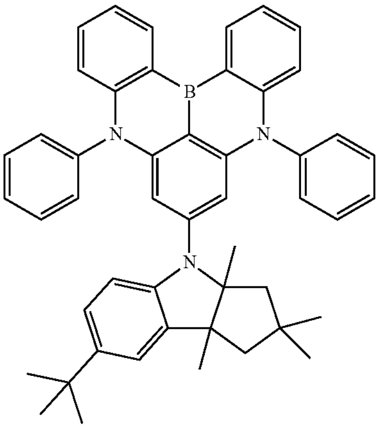
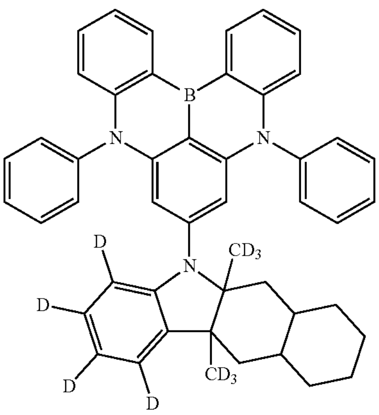
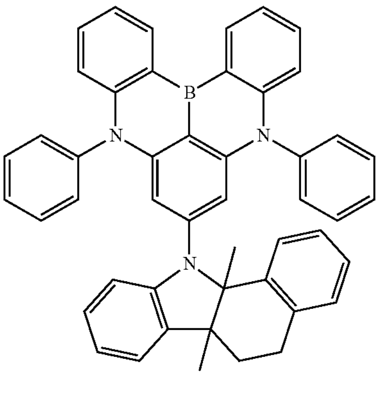
-continued
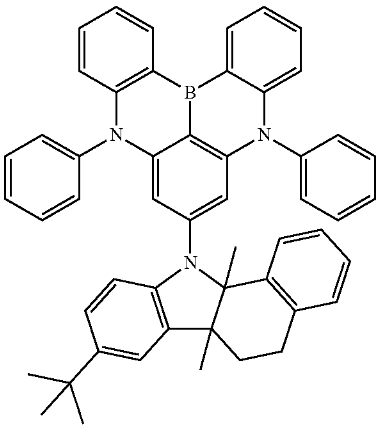
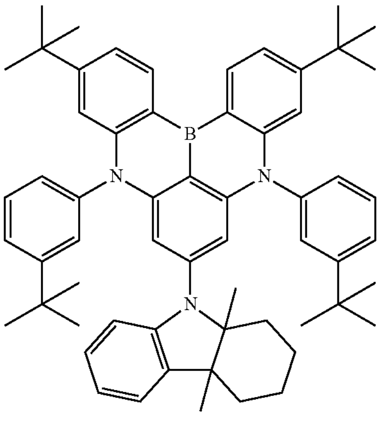
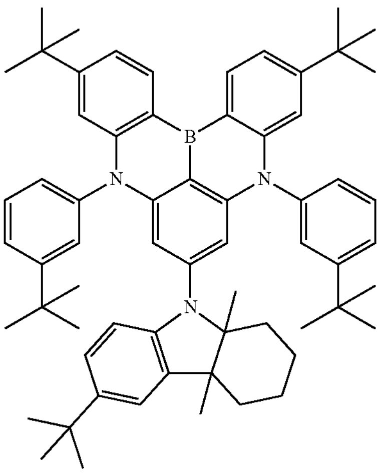

-continued
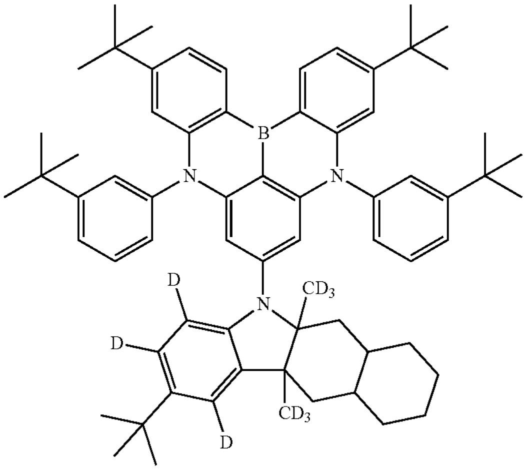
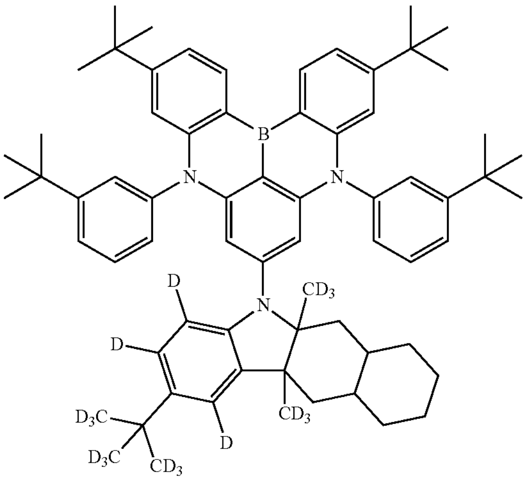
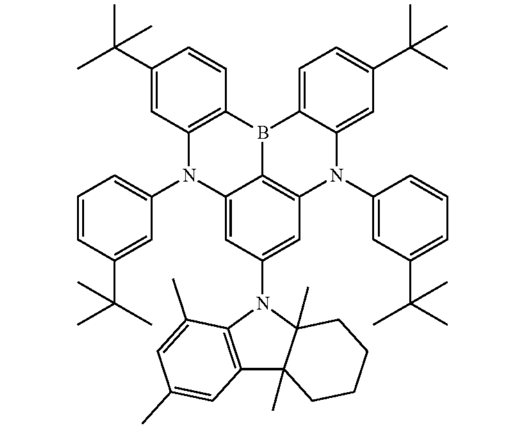
-continued
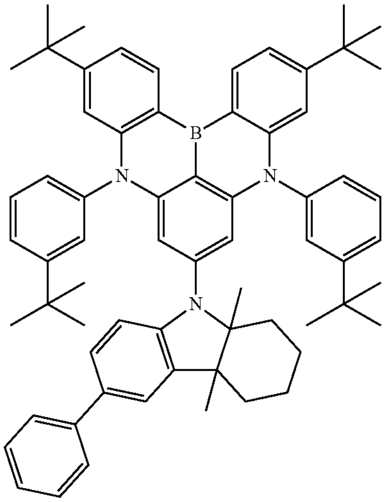
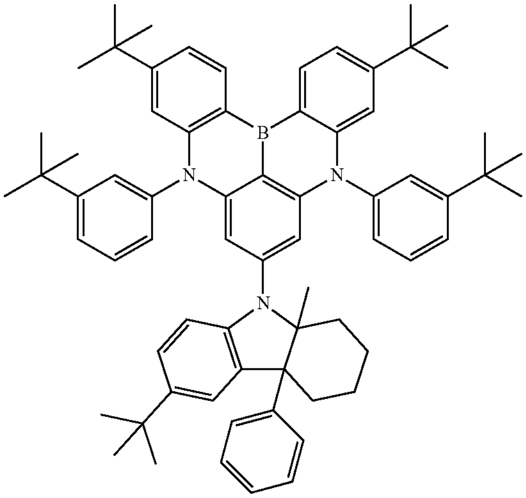
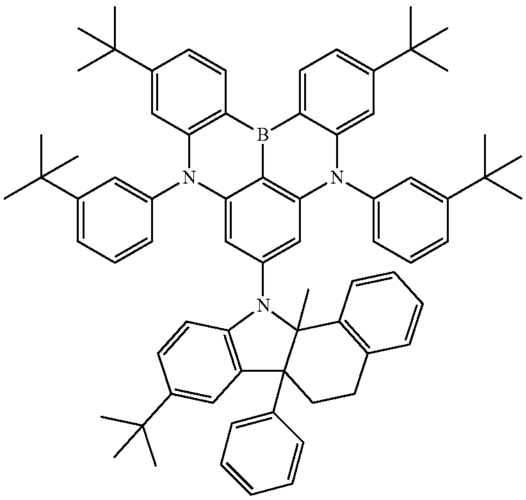

-continued
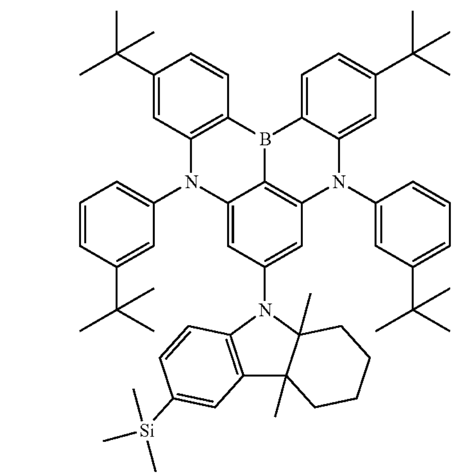
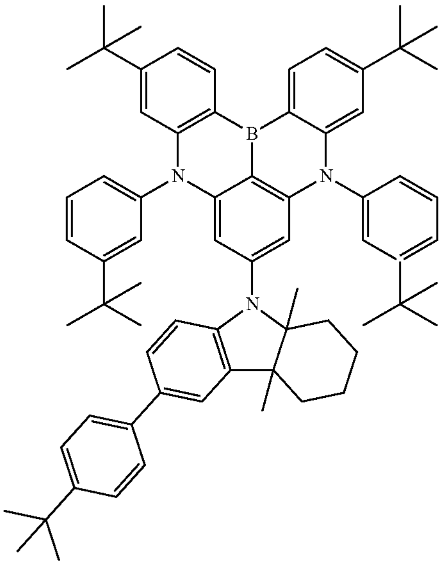
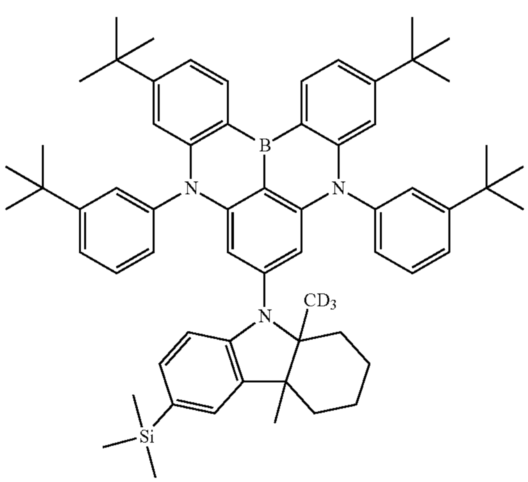
-continued
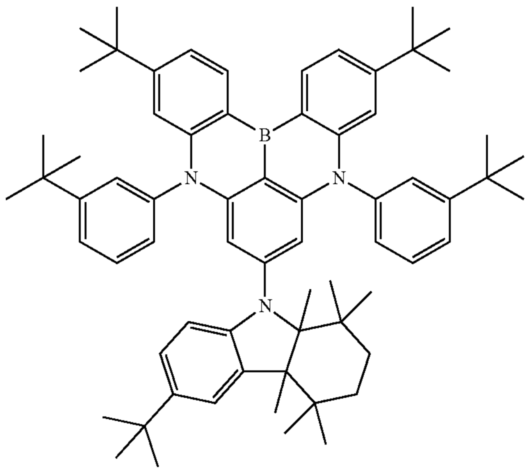
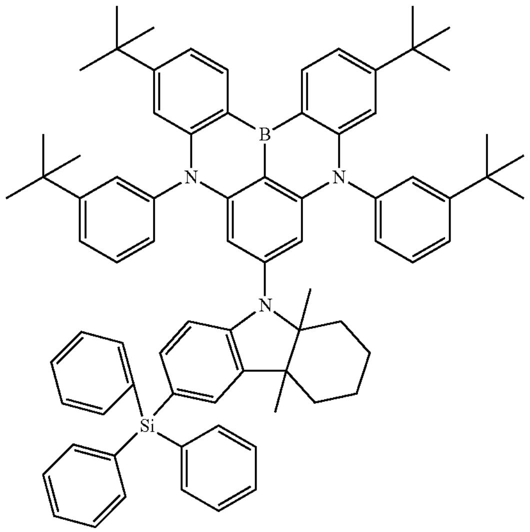
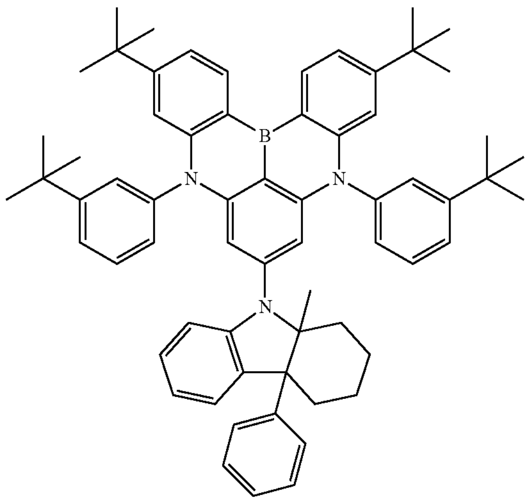

-continued
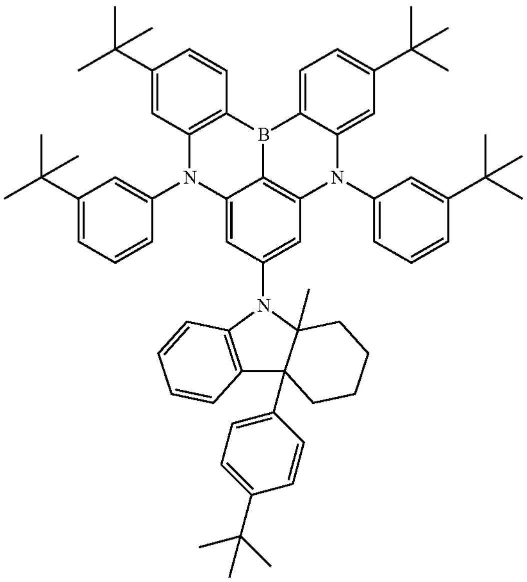
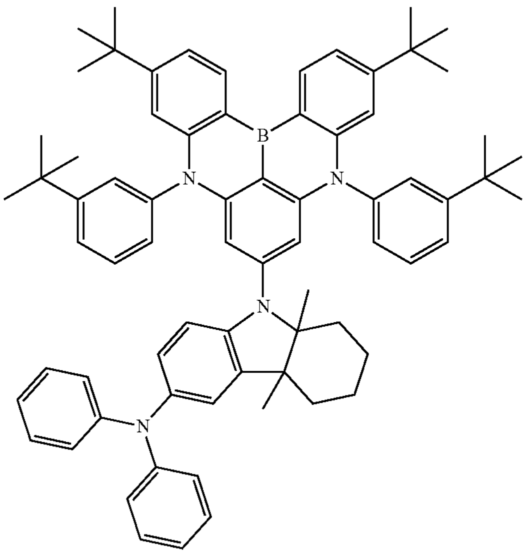
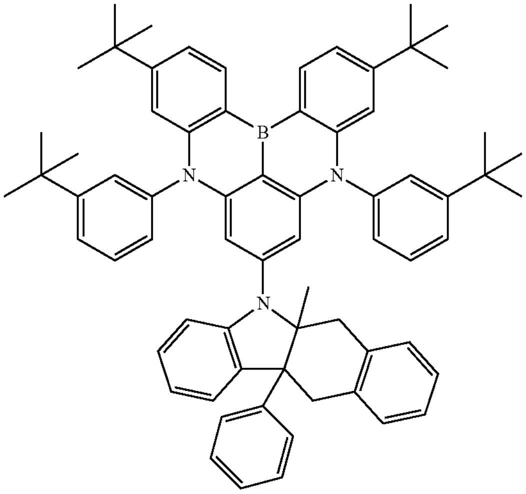
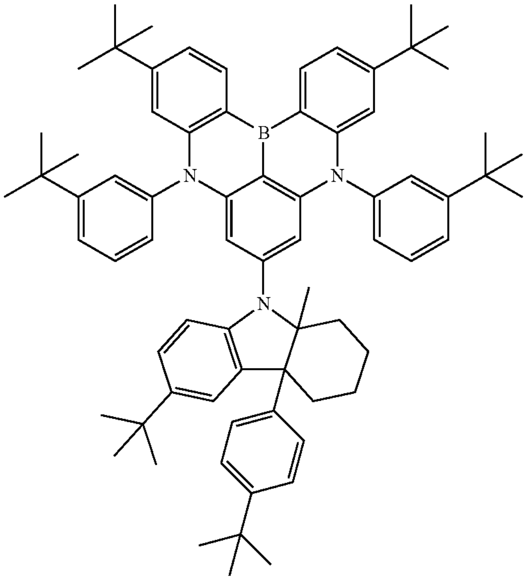
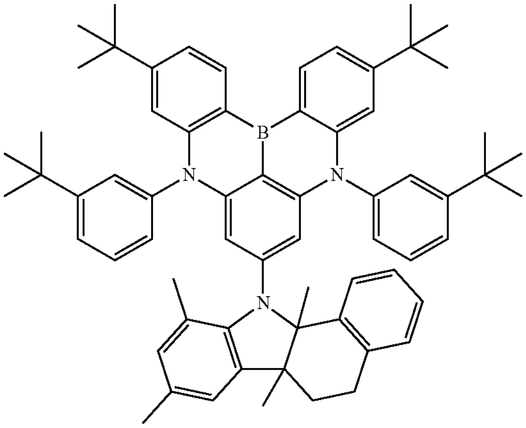

-continued
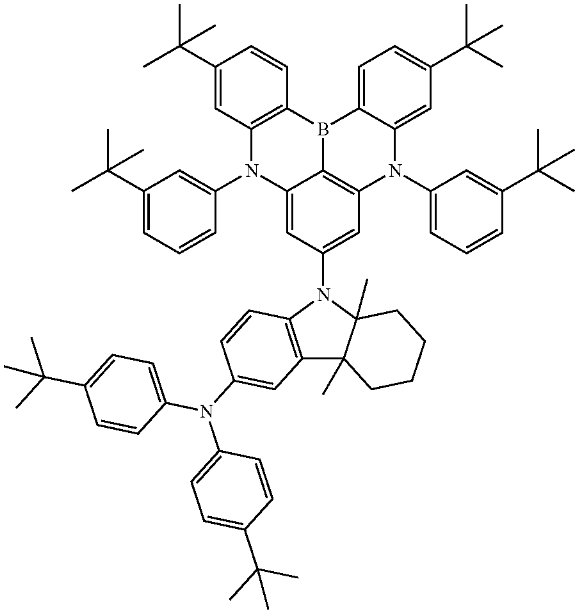
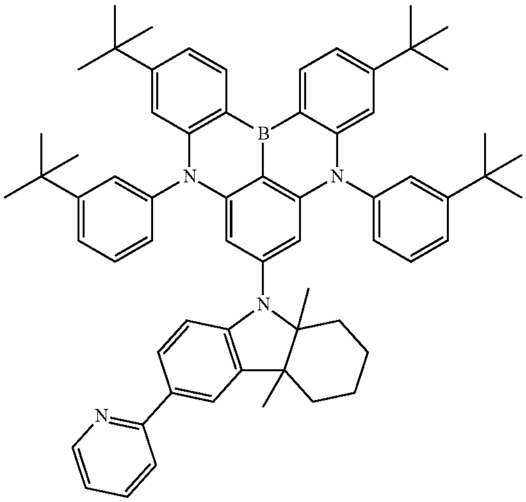
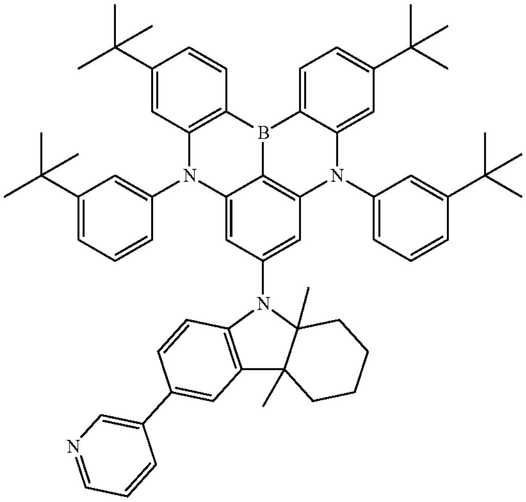
-continued
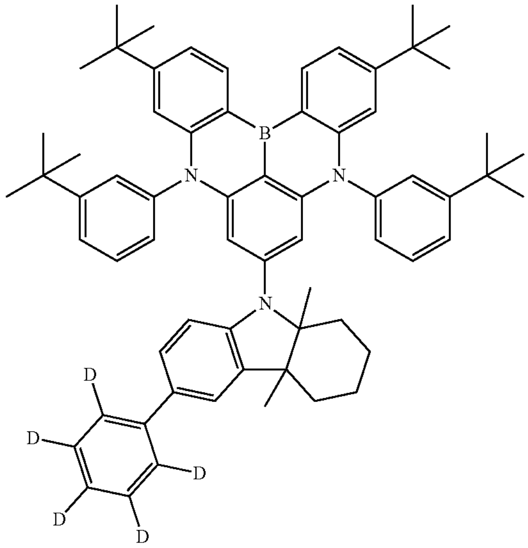
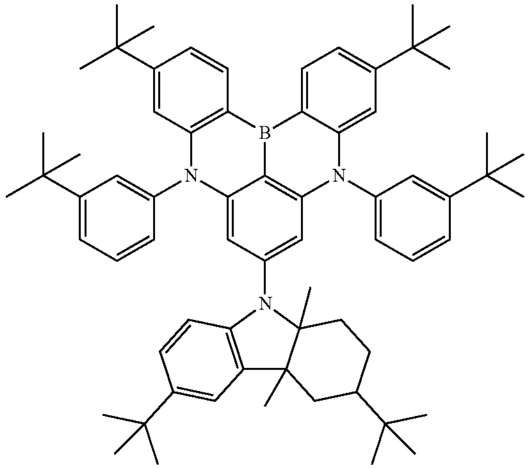
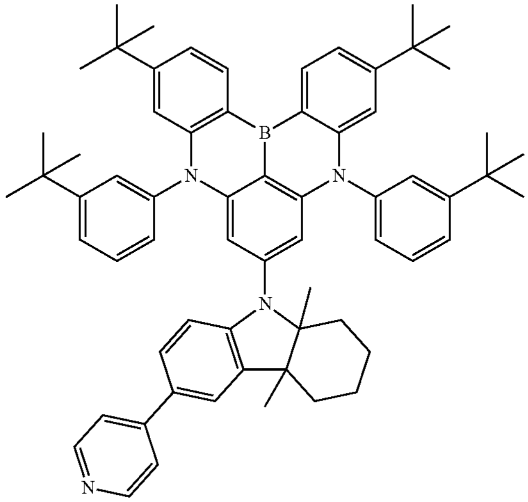

-continued
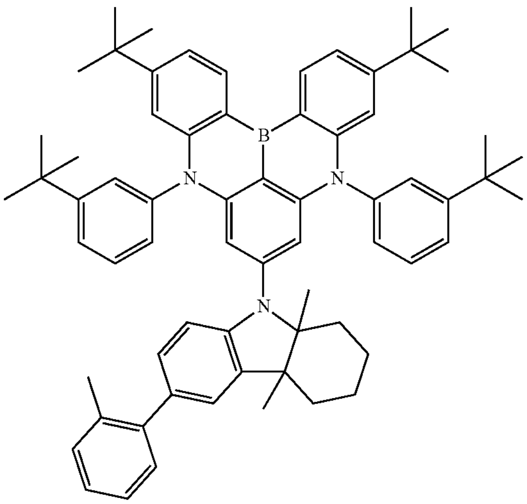
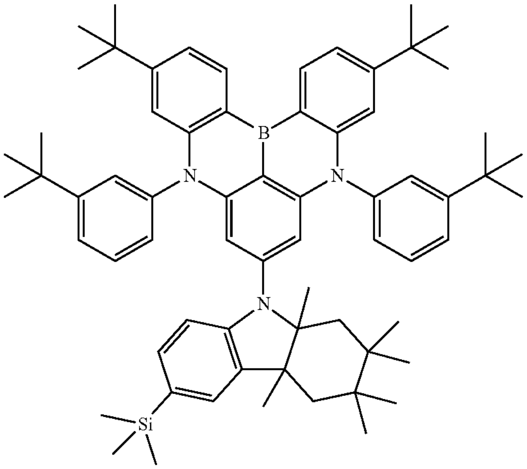
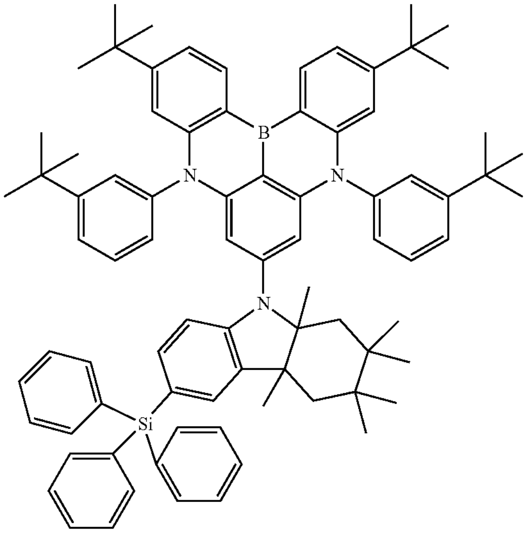
-continued
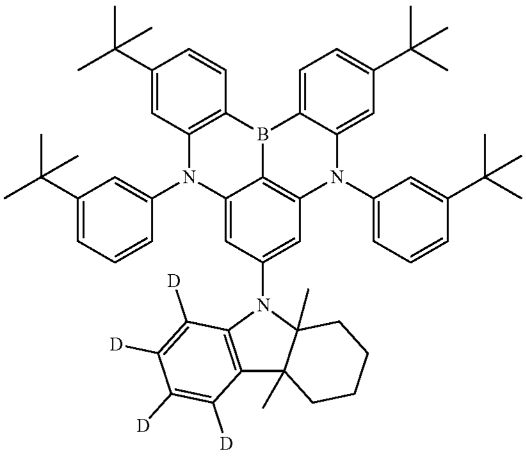
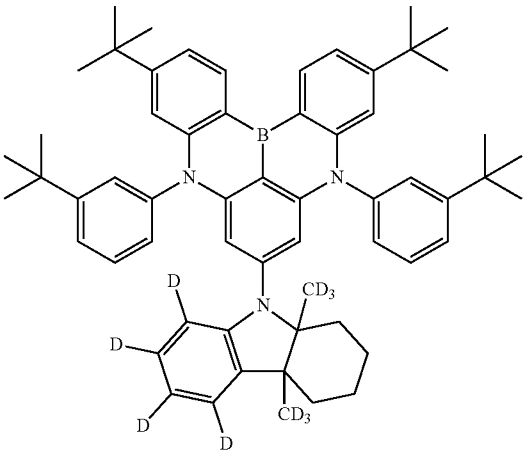
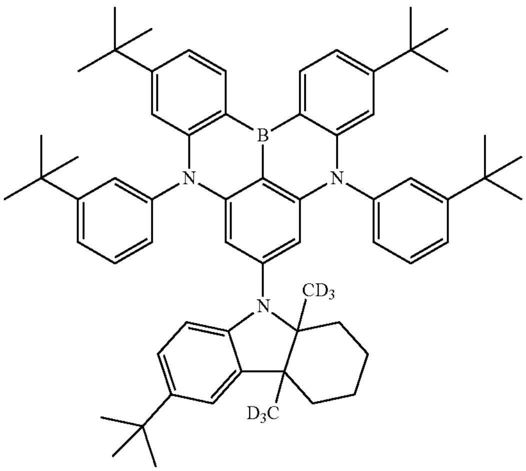

-continued
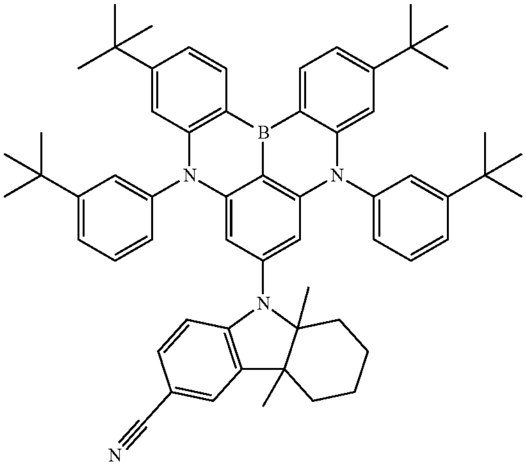
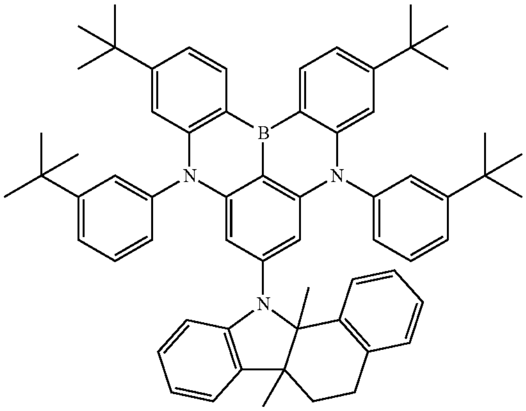
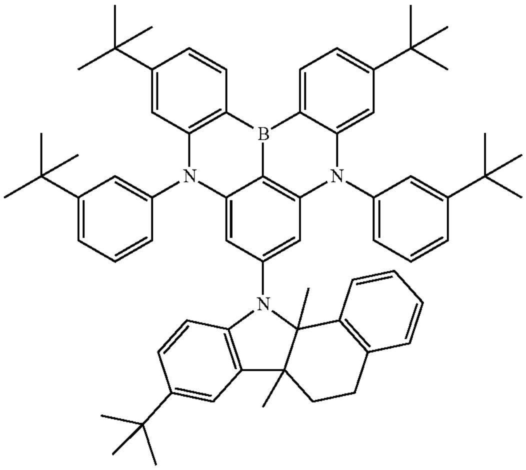
-continued
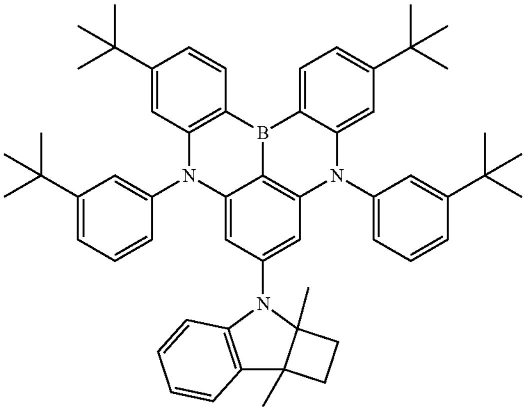
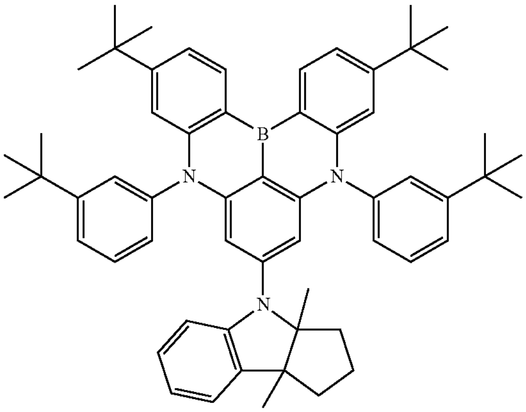
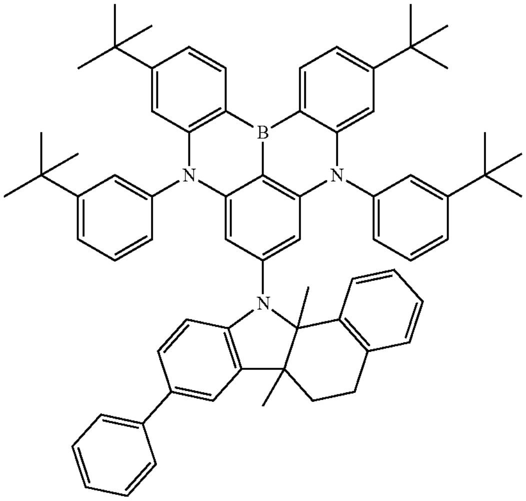

-continued
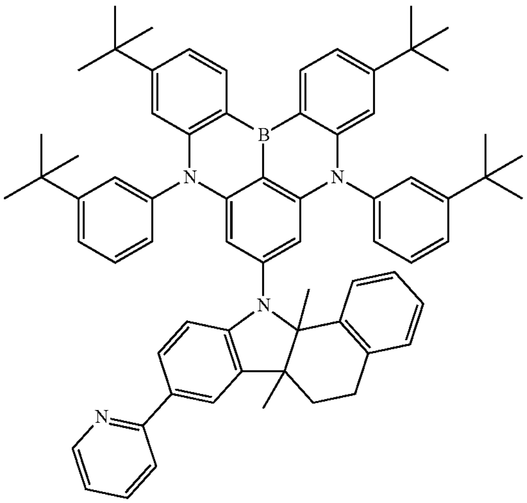
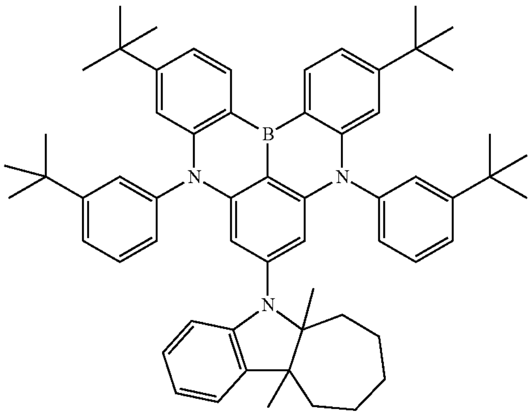
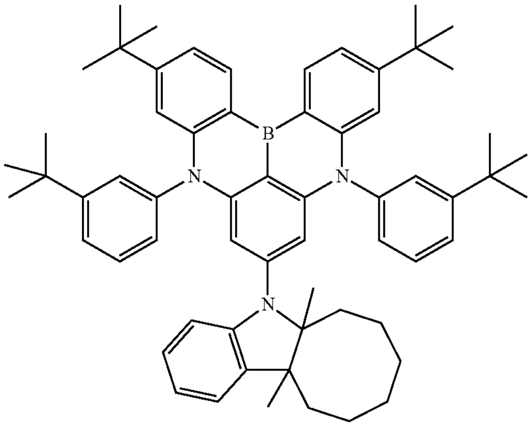
-continued
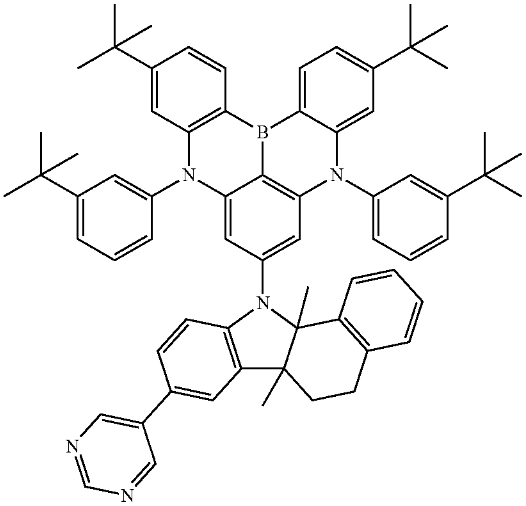
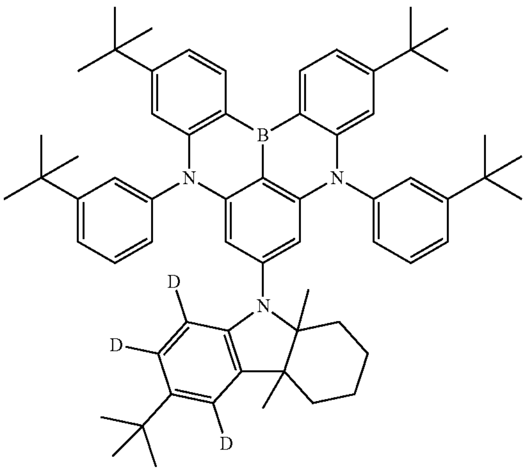
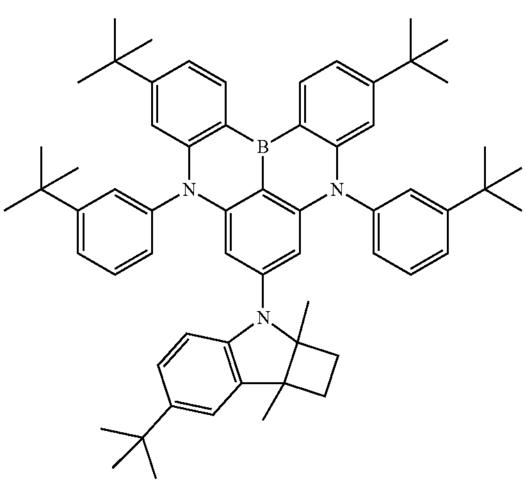

-continued
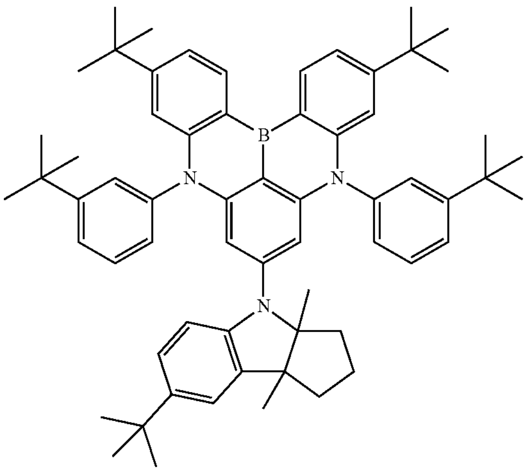
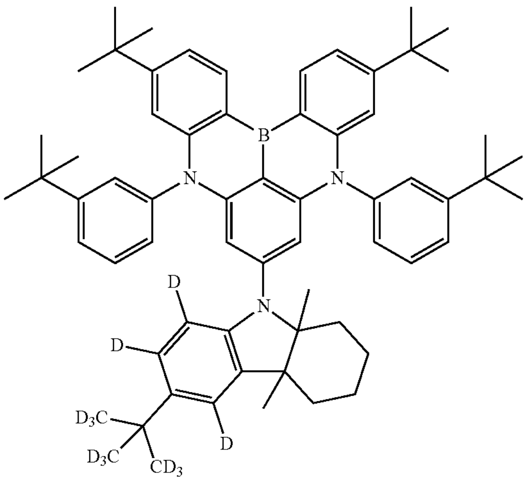
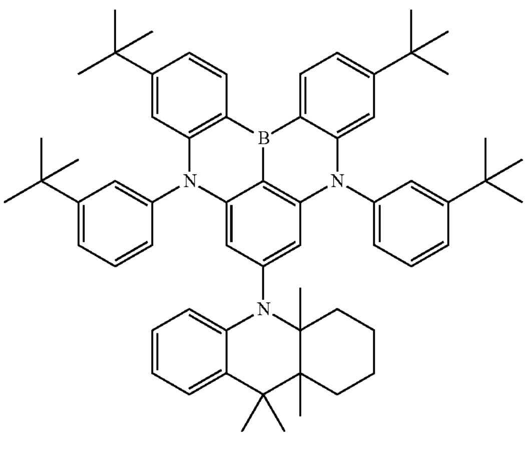
-continued
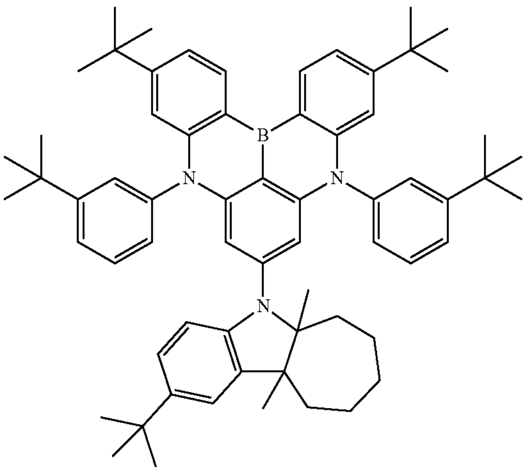
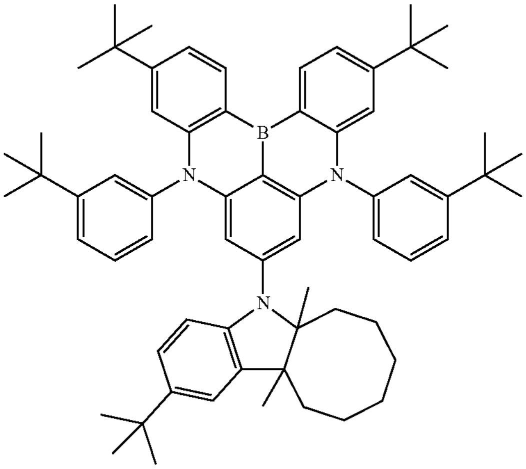
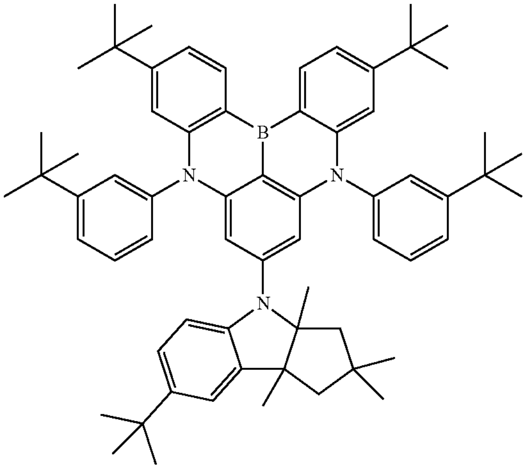

-continued
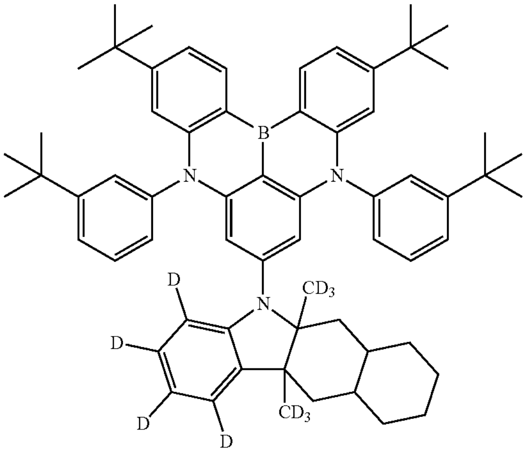
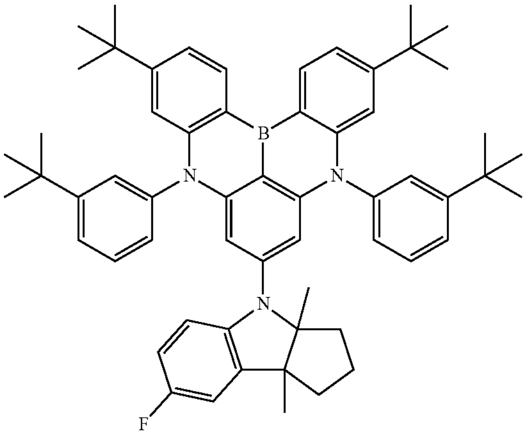
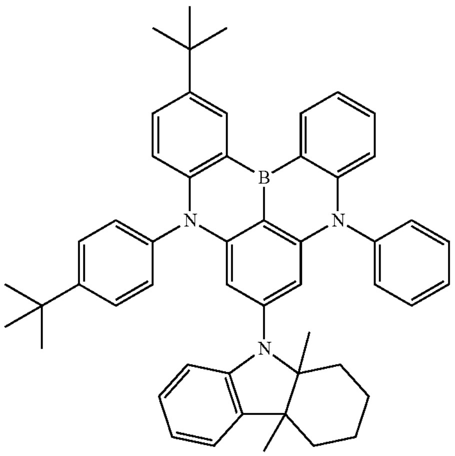
-continued
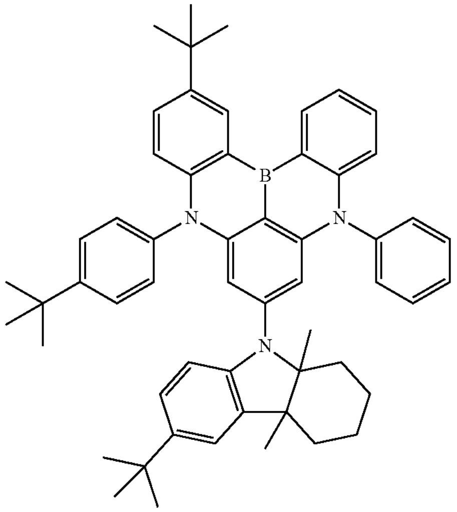
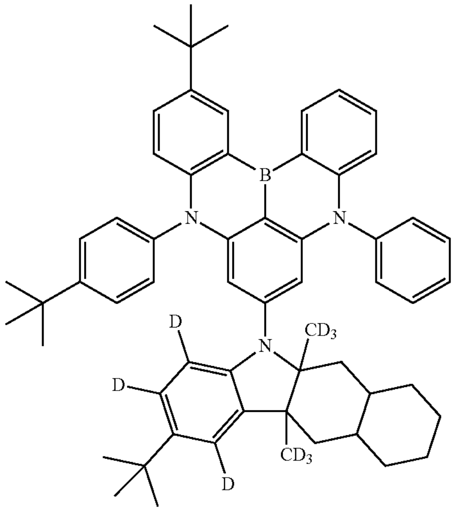
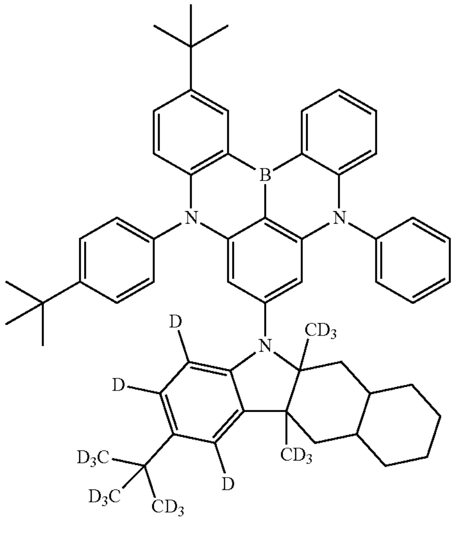

-continued
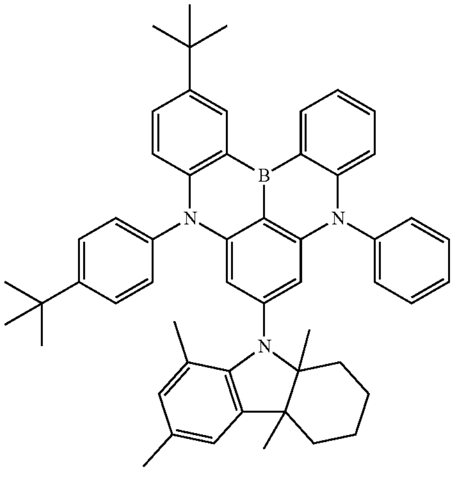
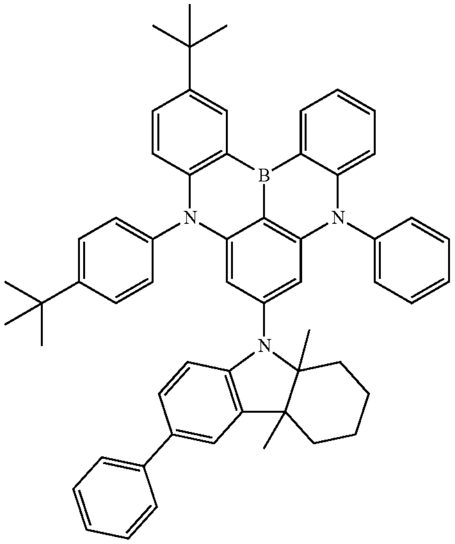
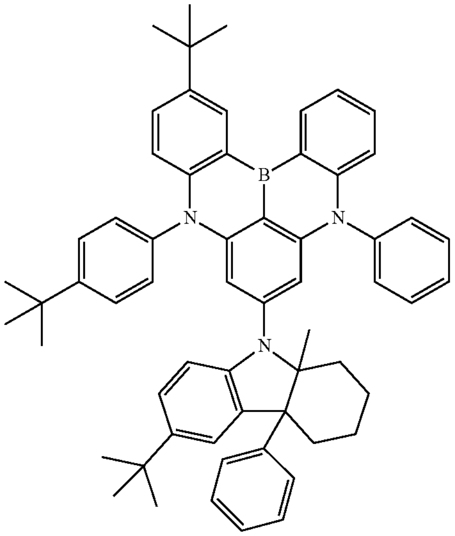
-continued
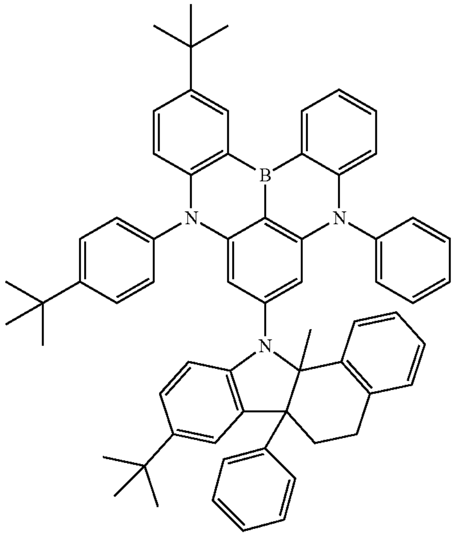
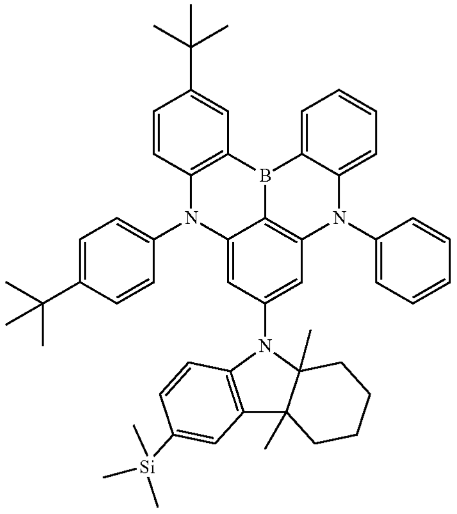
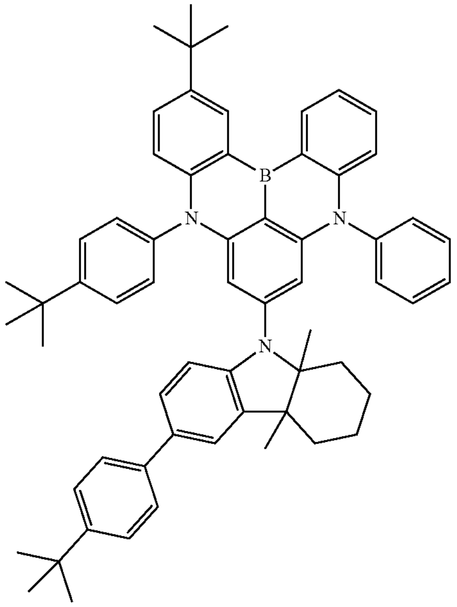

-continued
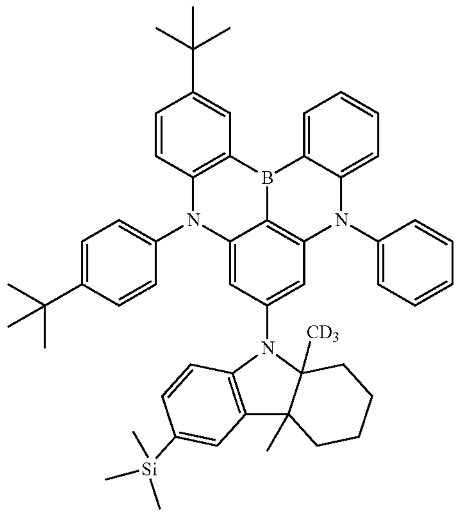
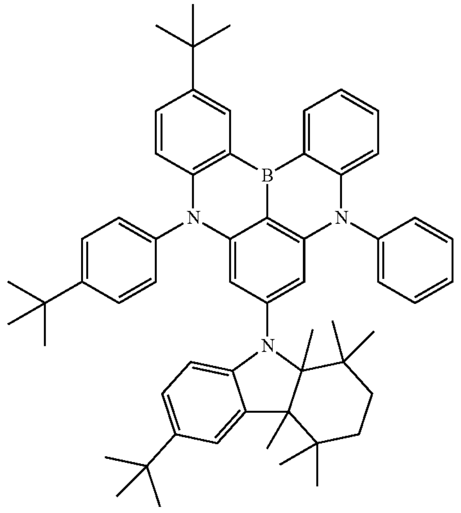
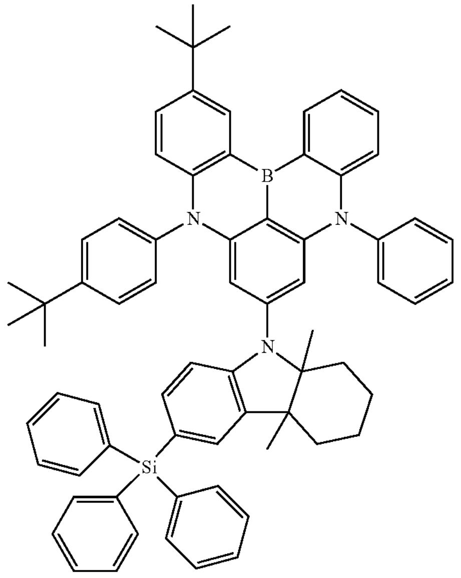
-continued
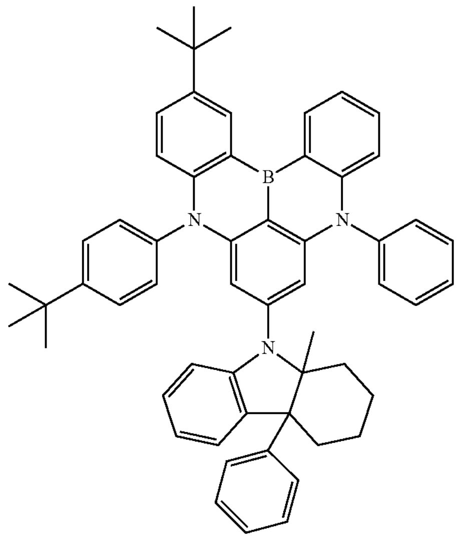
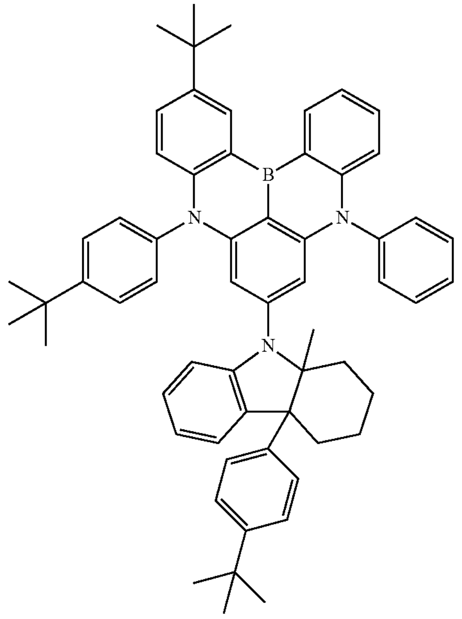

-continued
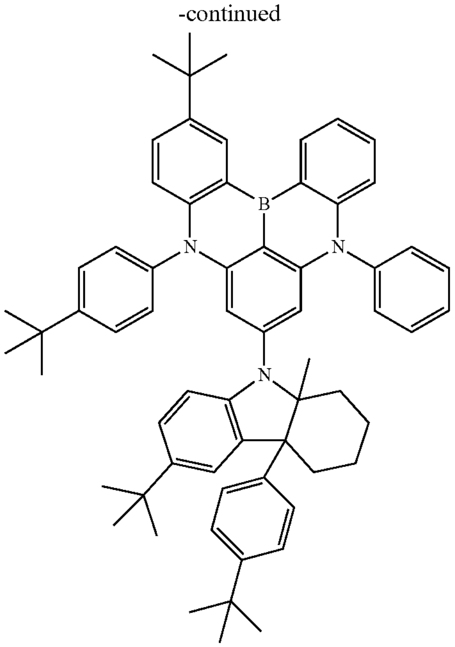
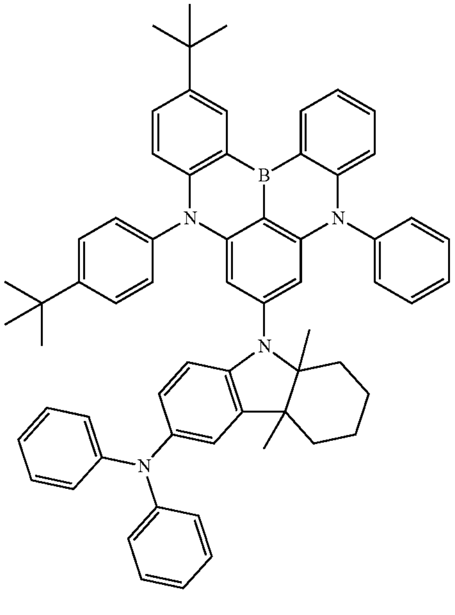
-continued
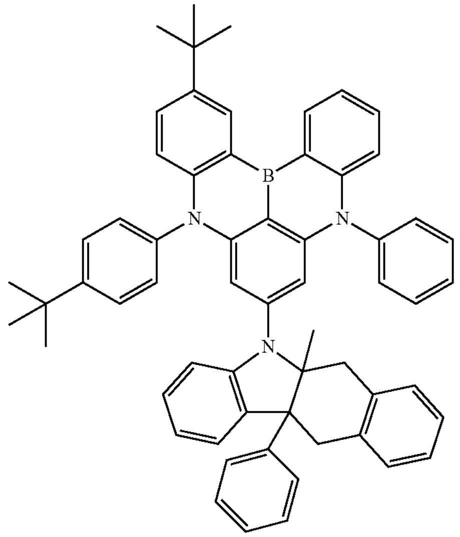
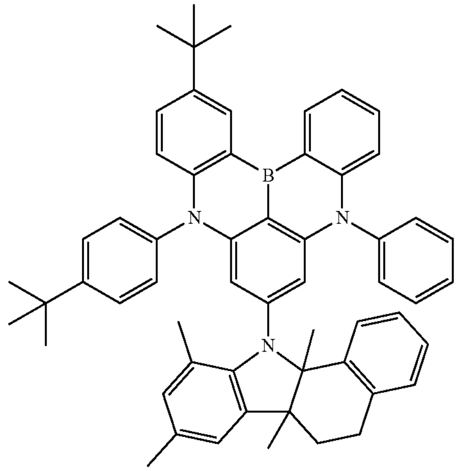
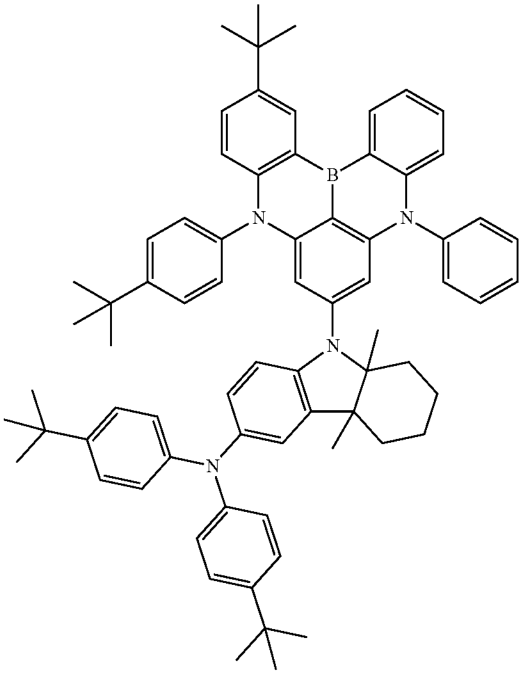

-continued
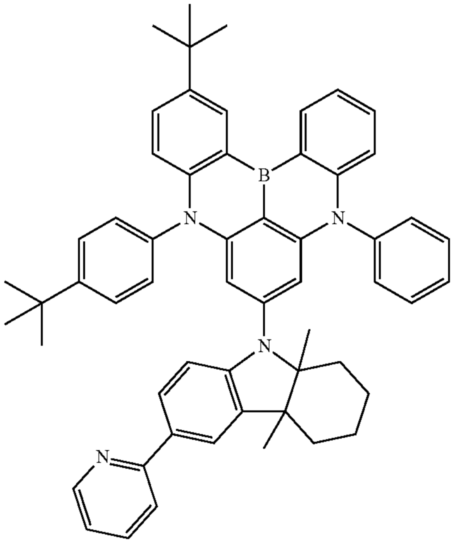
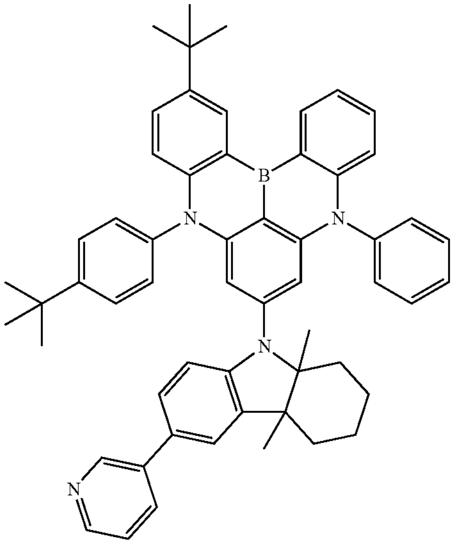
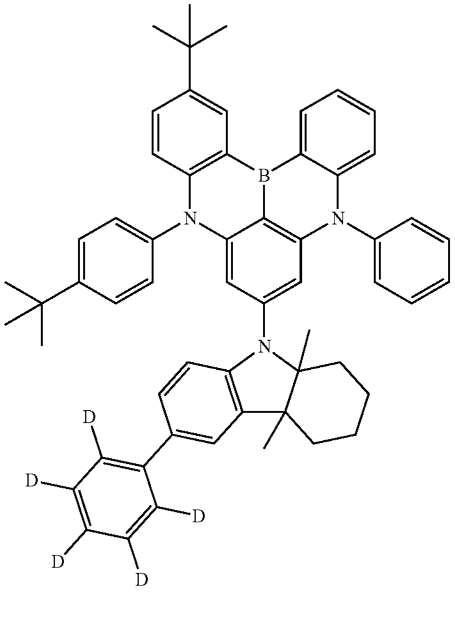
-continued
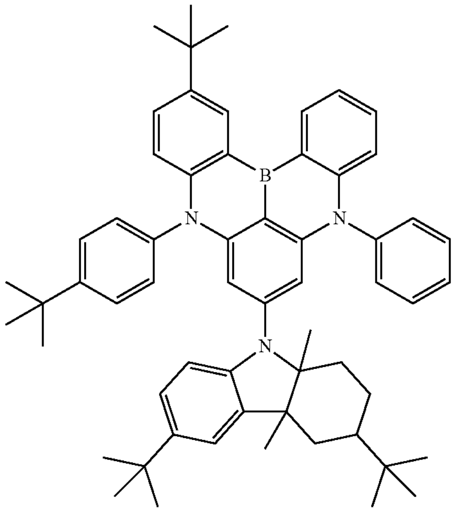
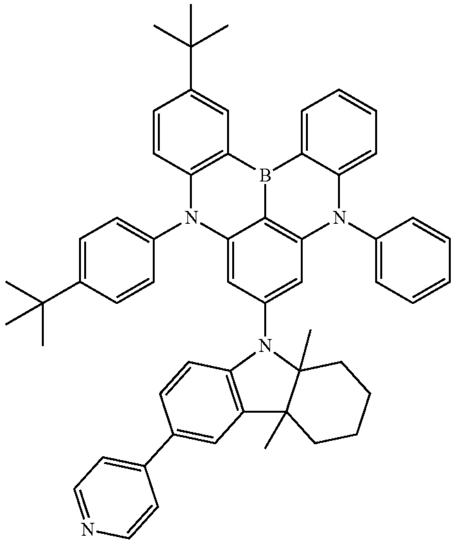
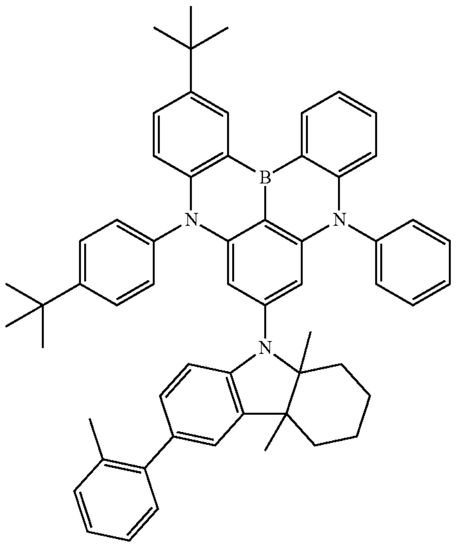

-continued
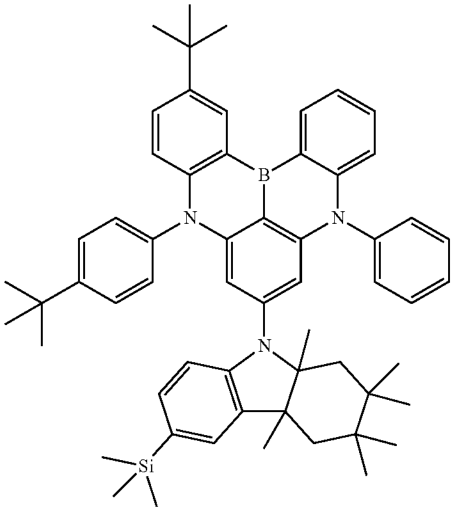
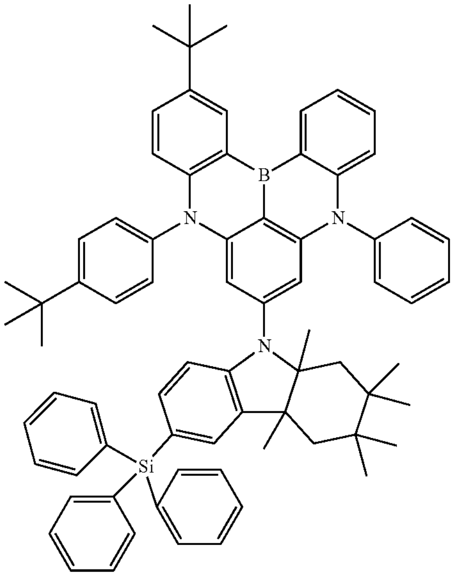
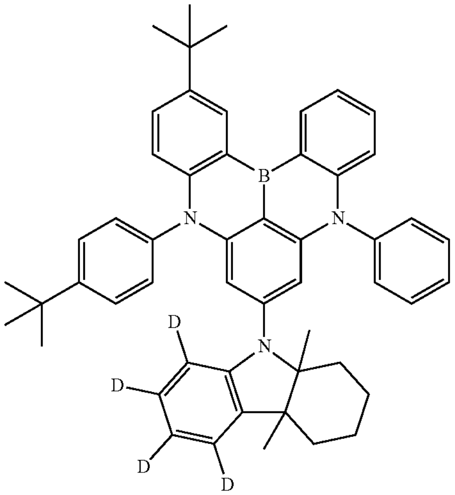
-continued
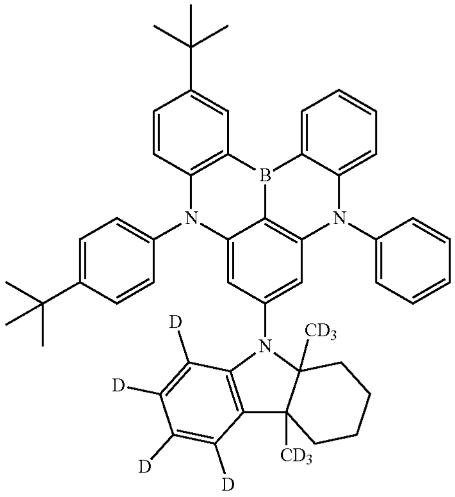
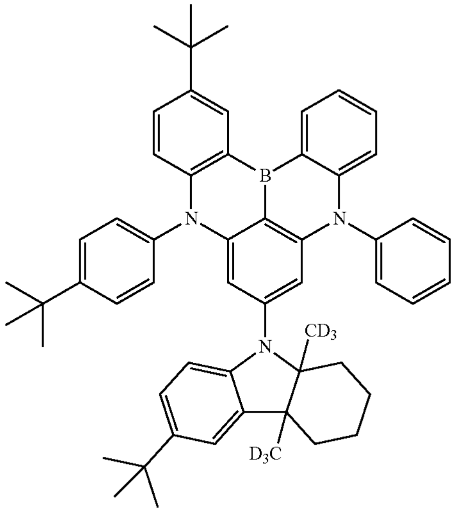
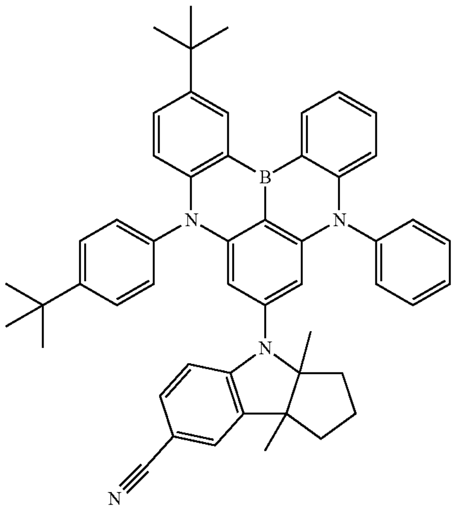

-continued
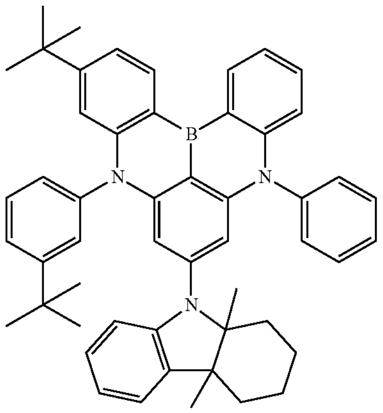
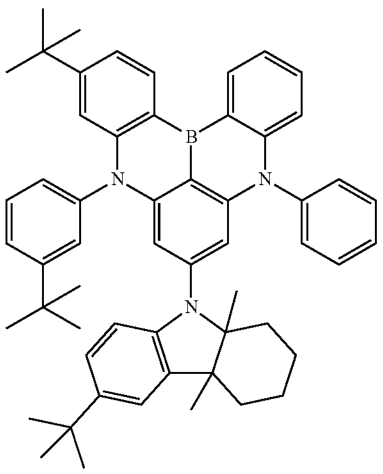
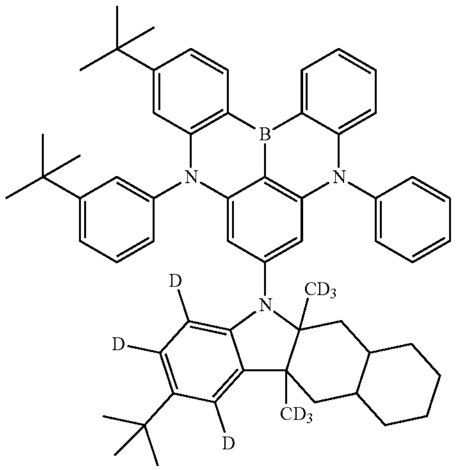
-continued
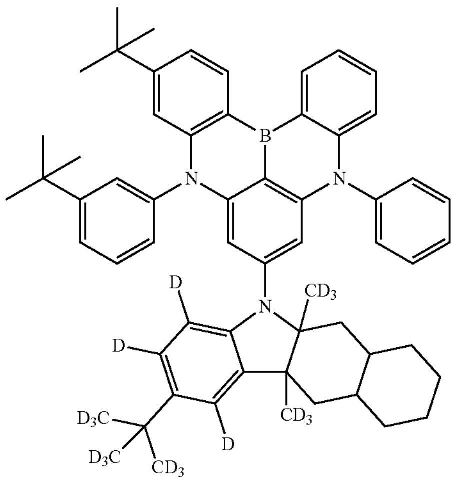
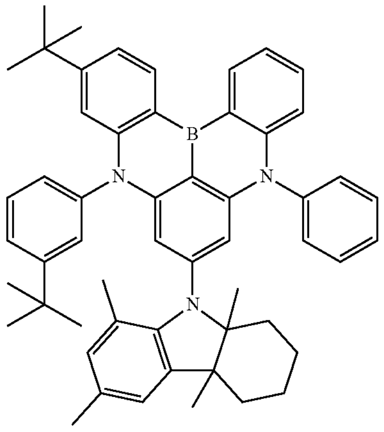
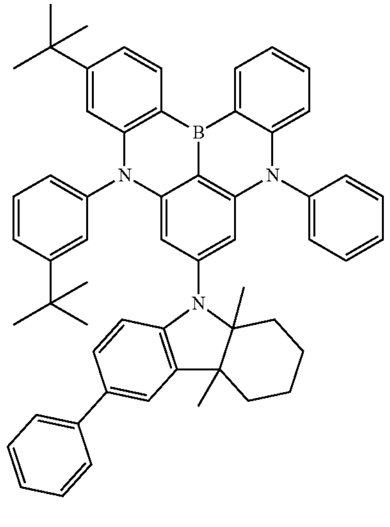

-continued
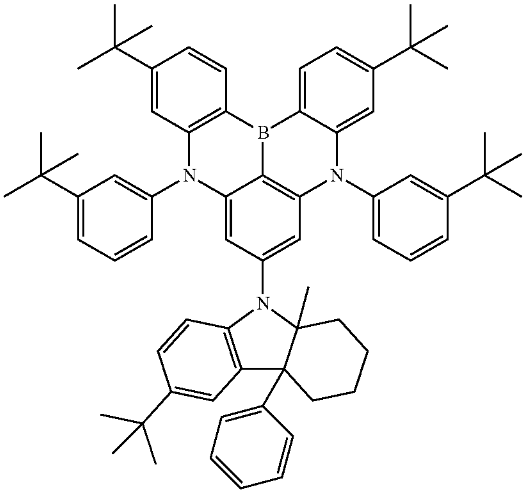
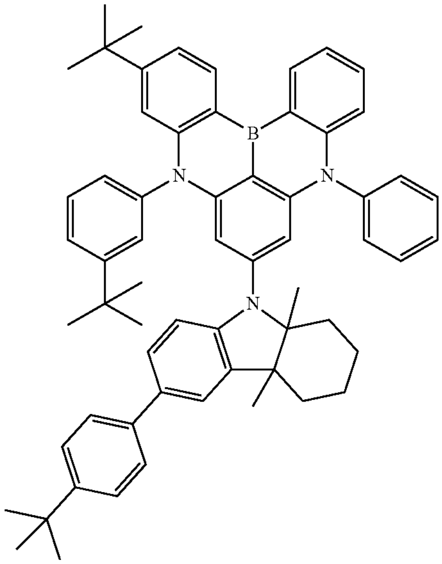
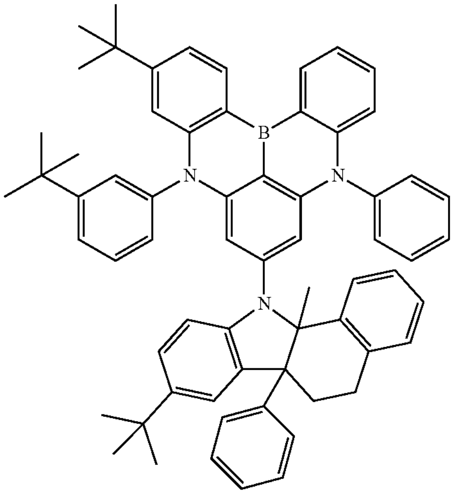
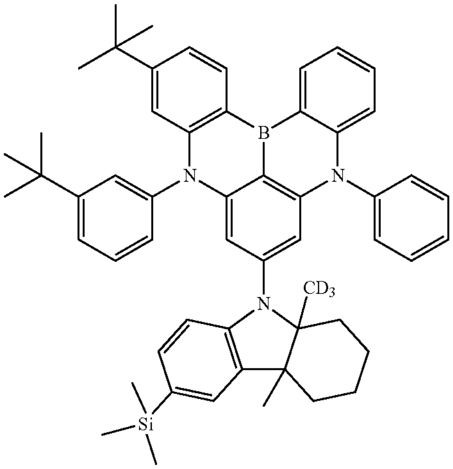
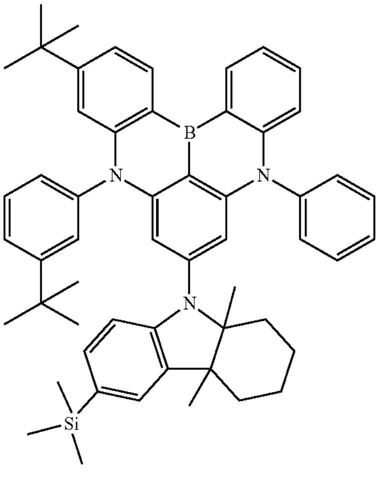
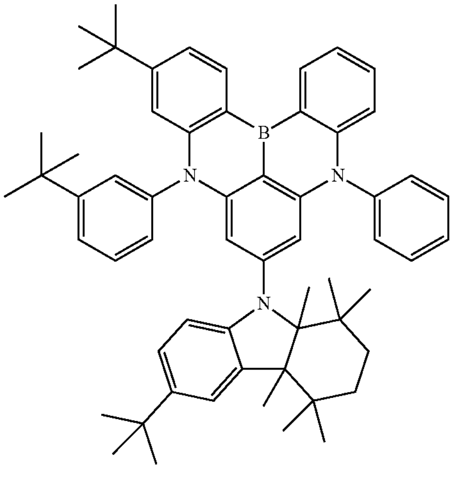

-continued
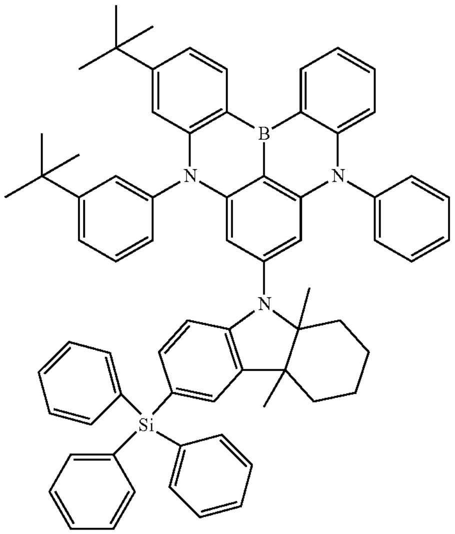
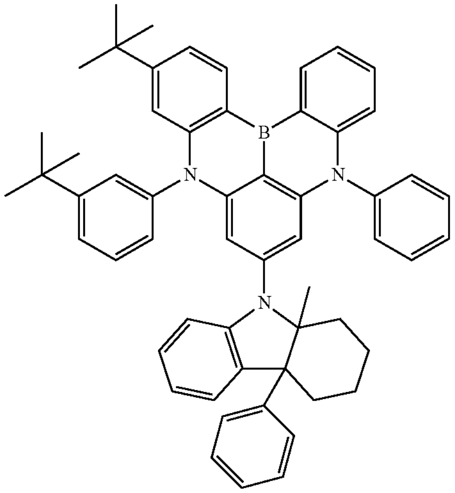
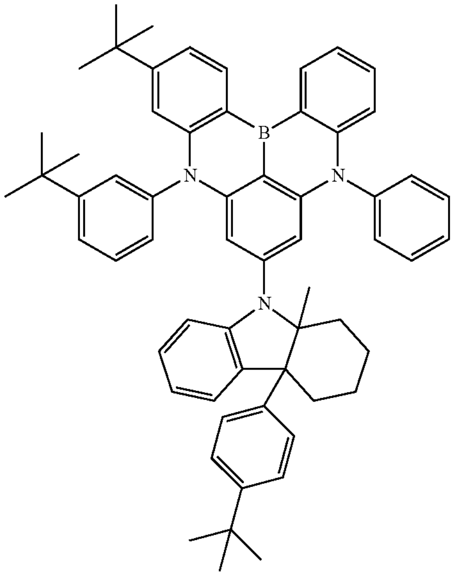
-continued
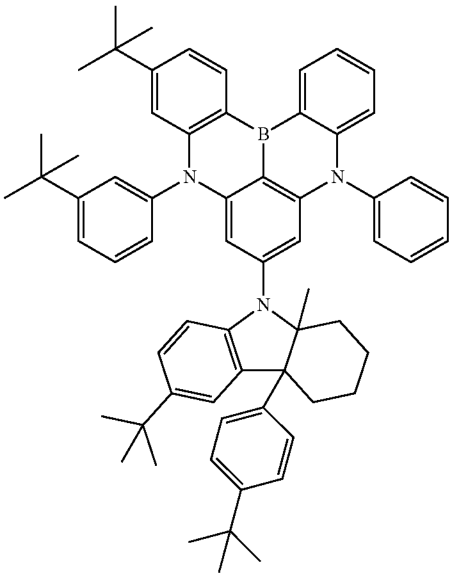
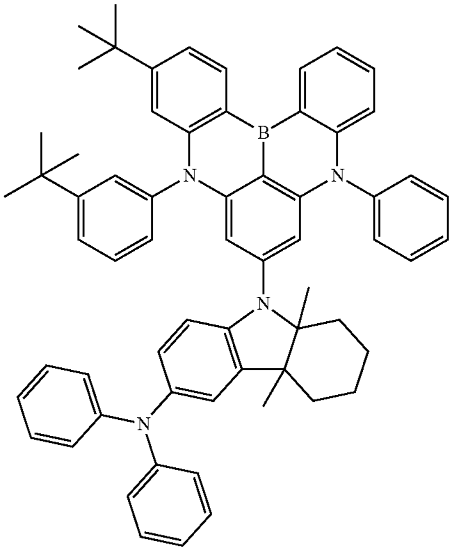
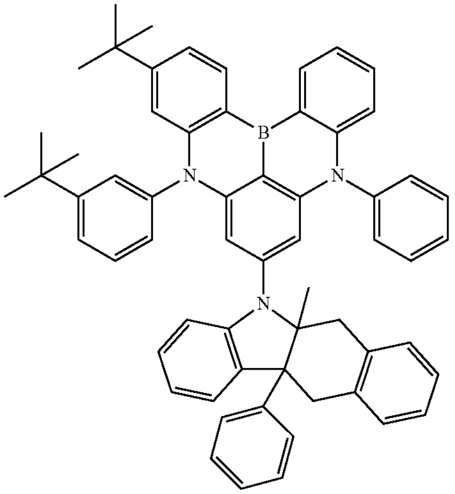

-continued
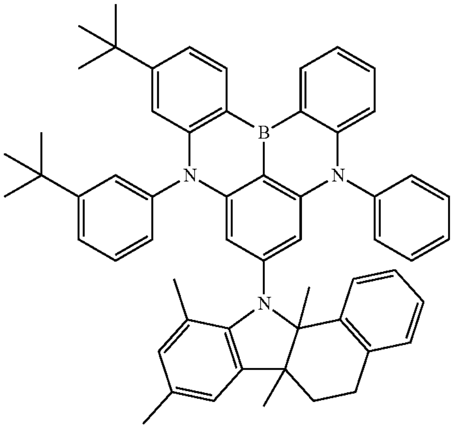
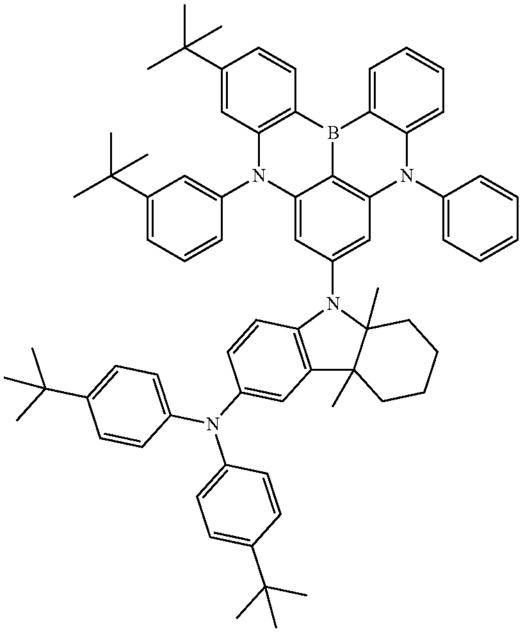
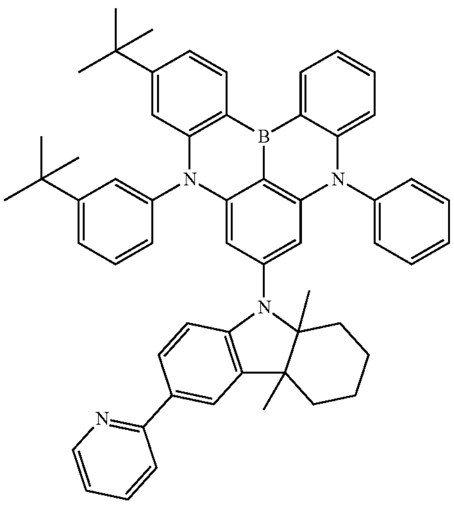
-continued
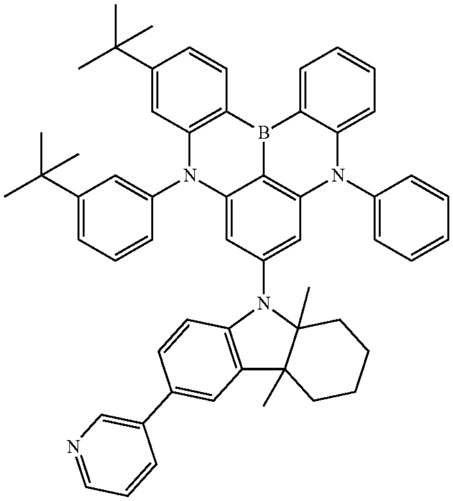
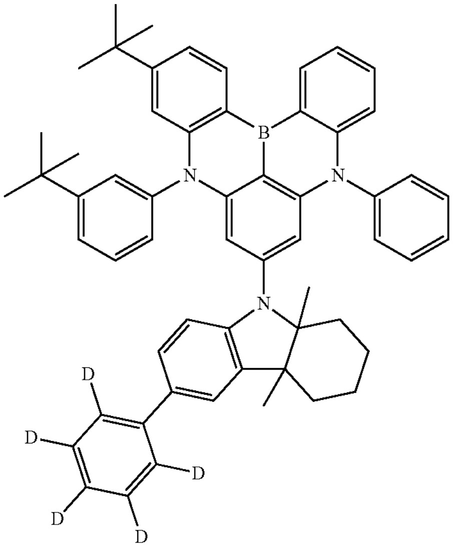
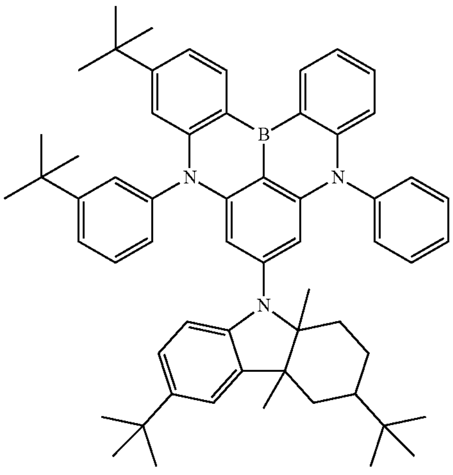

-continued
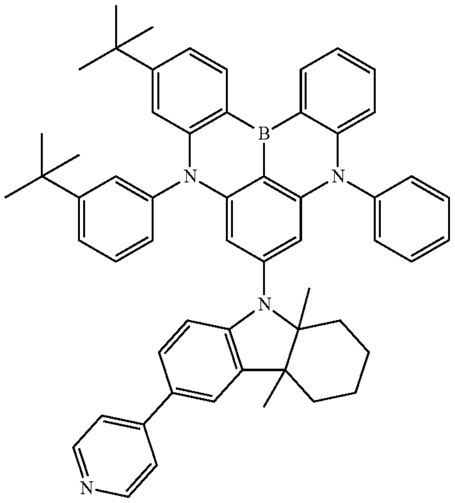
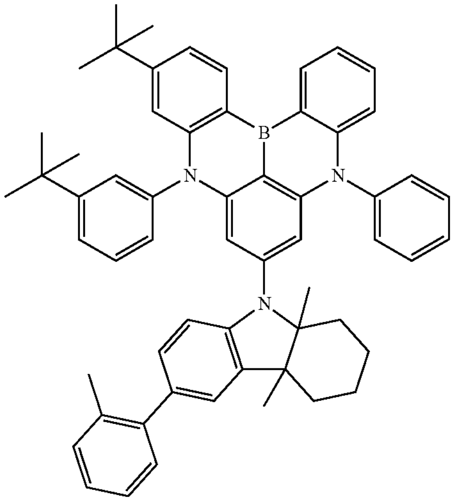
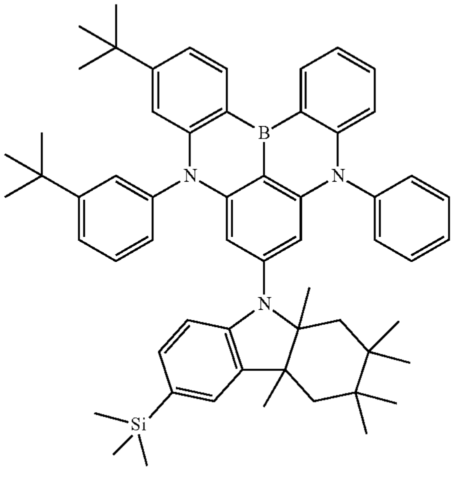
-continued
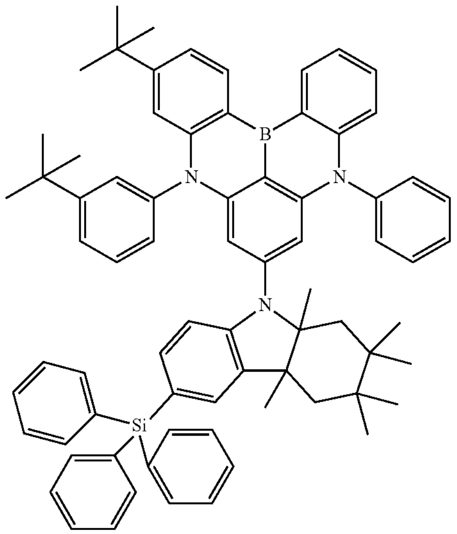
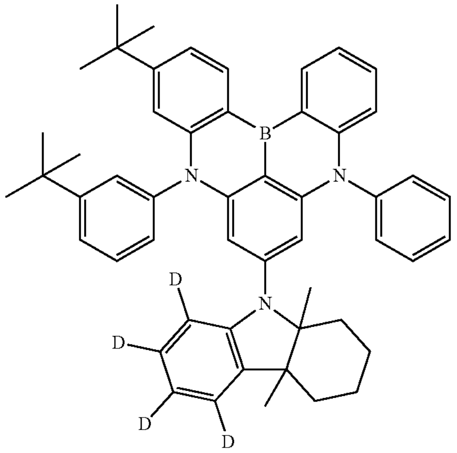
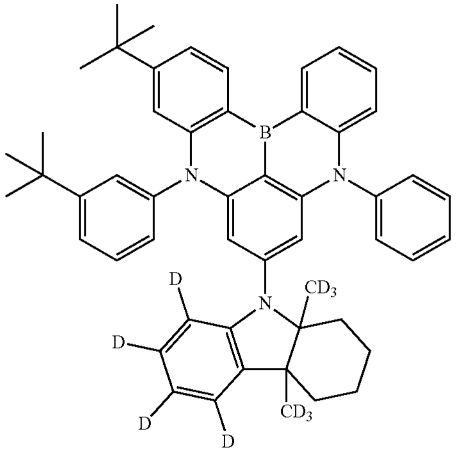

-continued
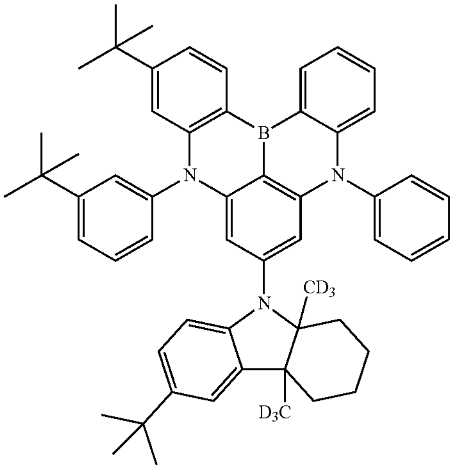
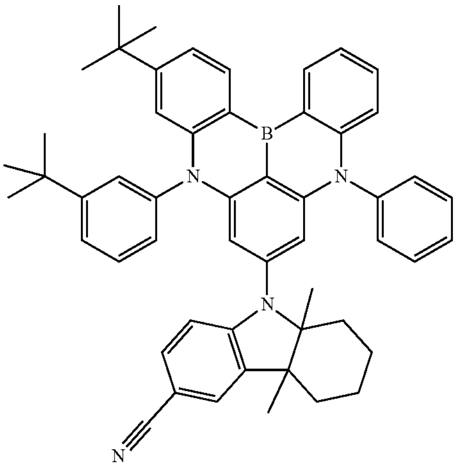
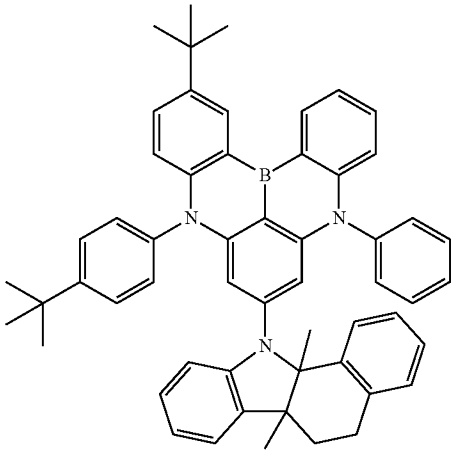
-continued
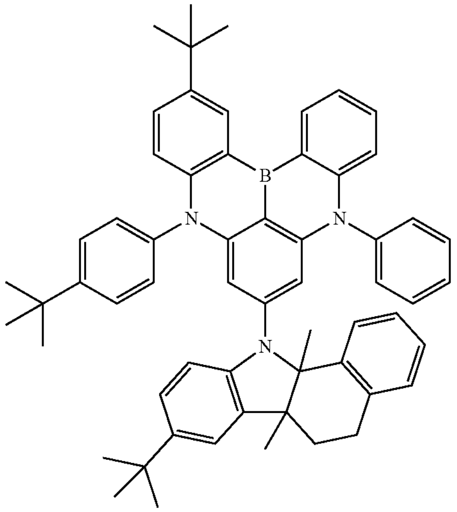
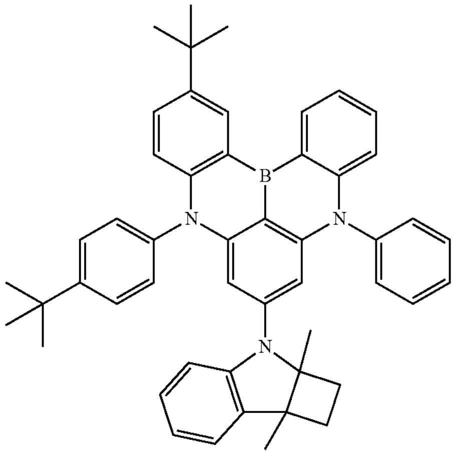
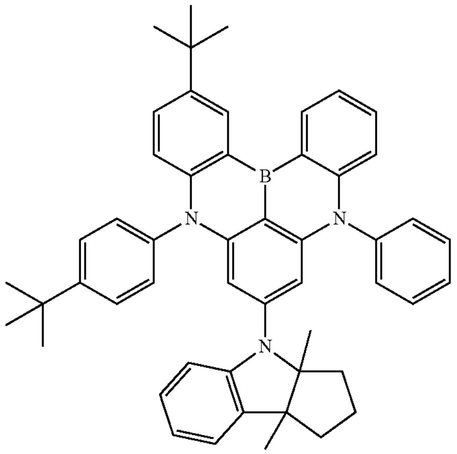

-continued
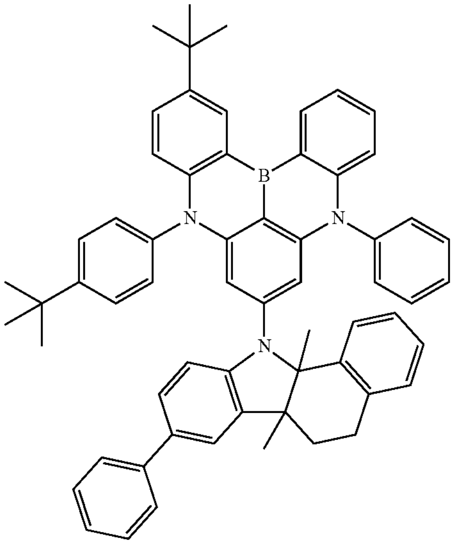
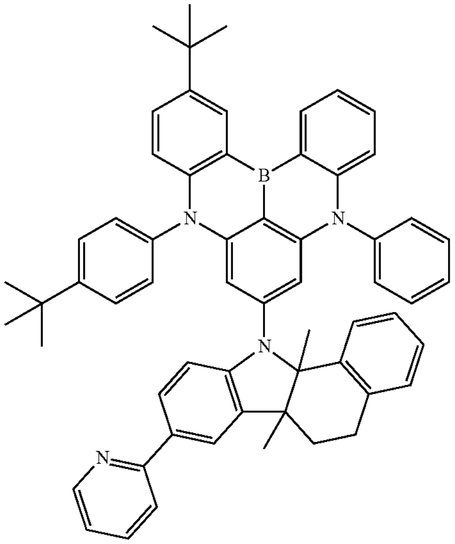
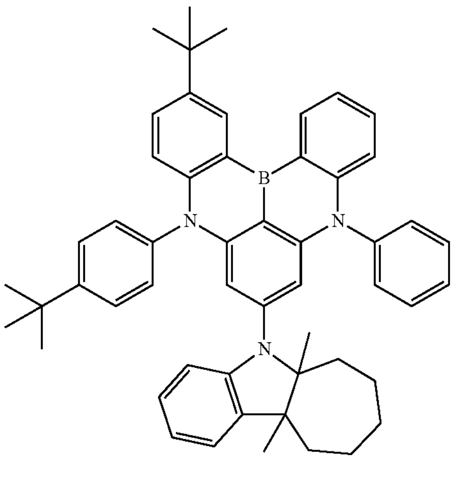
-continued
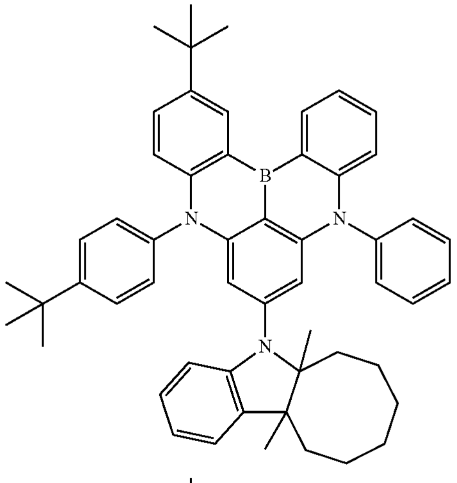
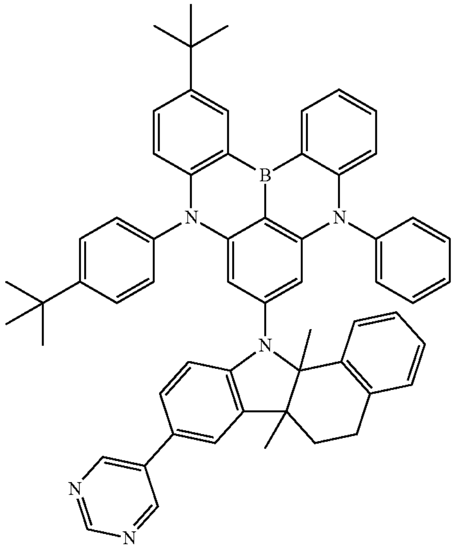
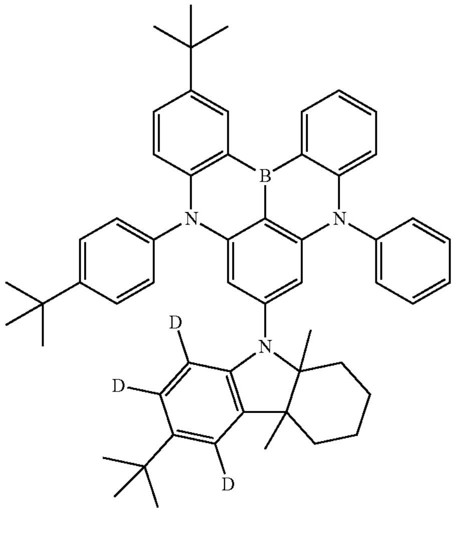

-continued
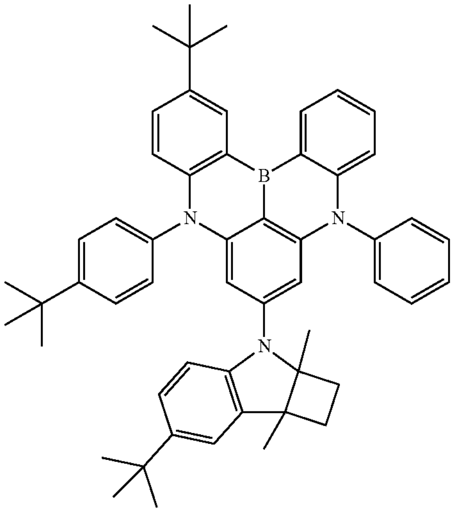
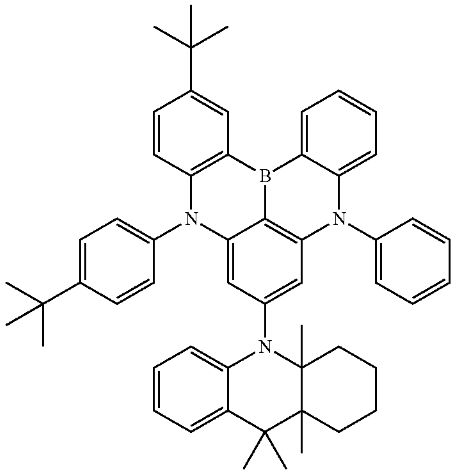
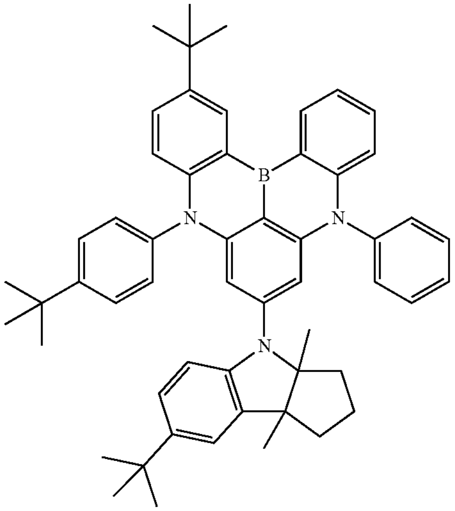
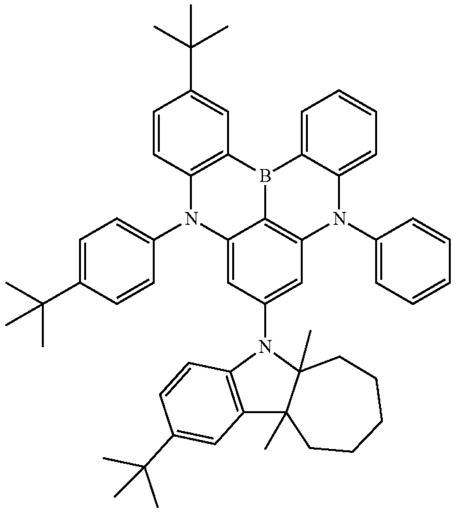
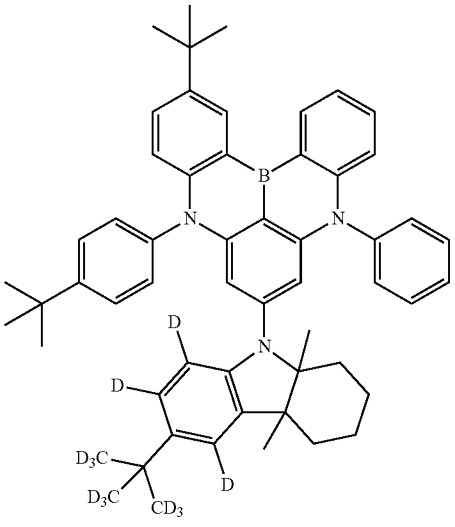
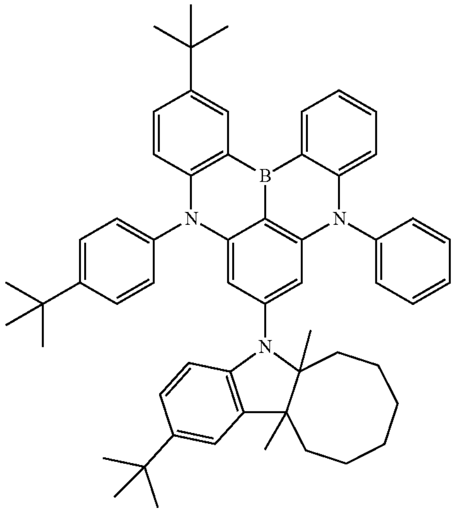
-continued -continued
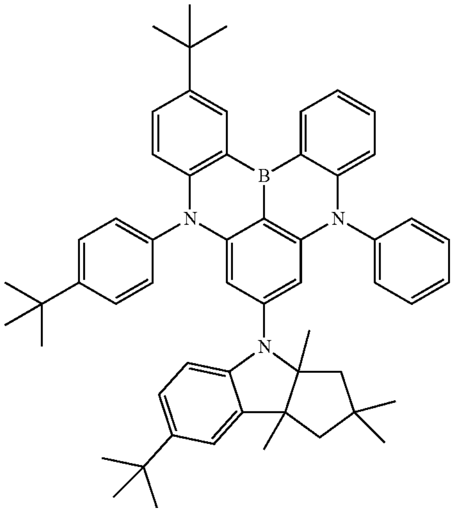
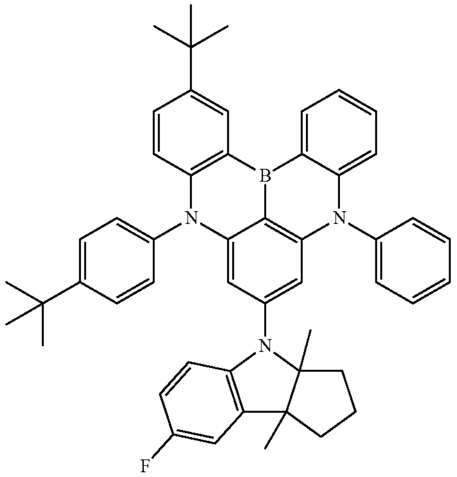
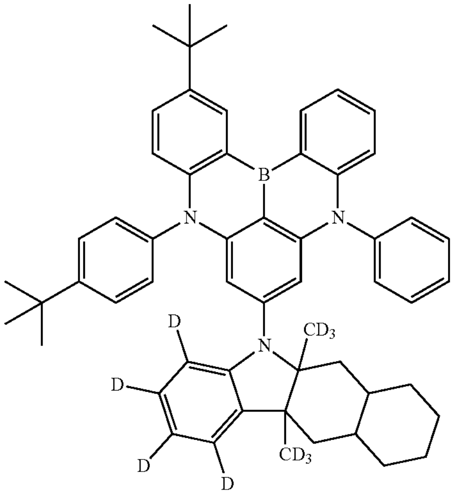
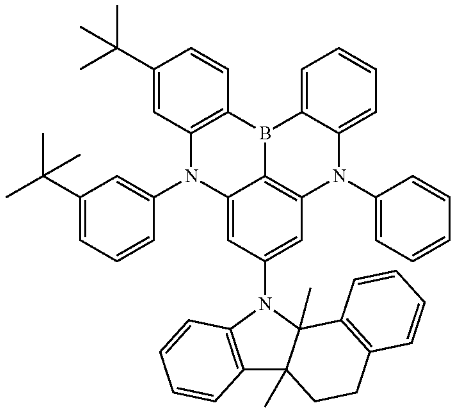
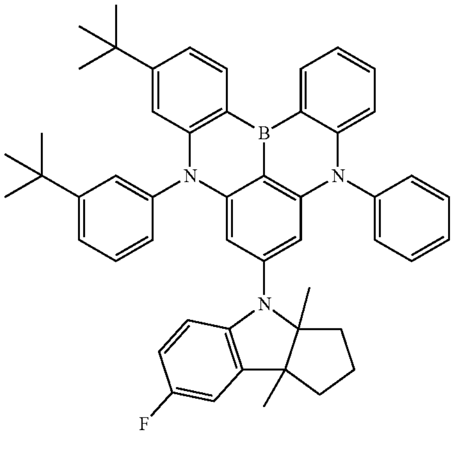
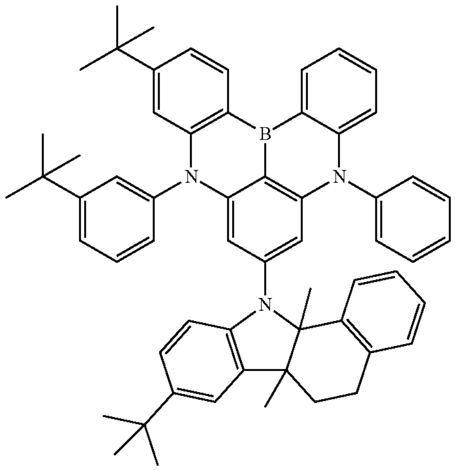

-continued
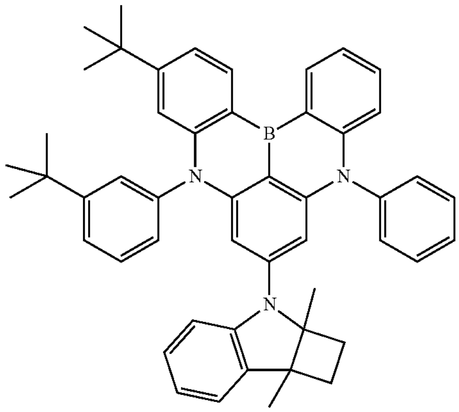
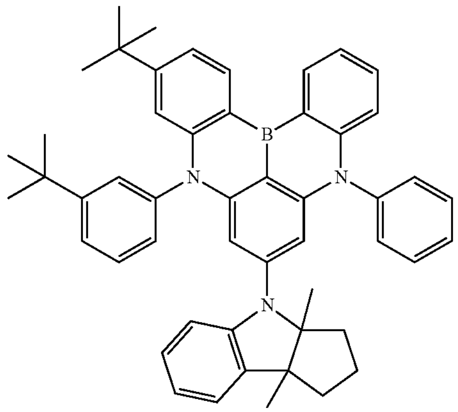
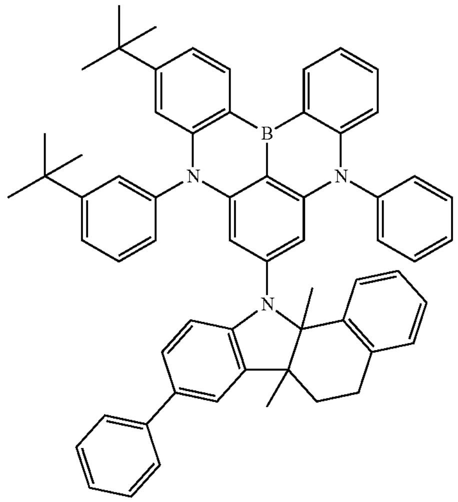
-continued
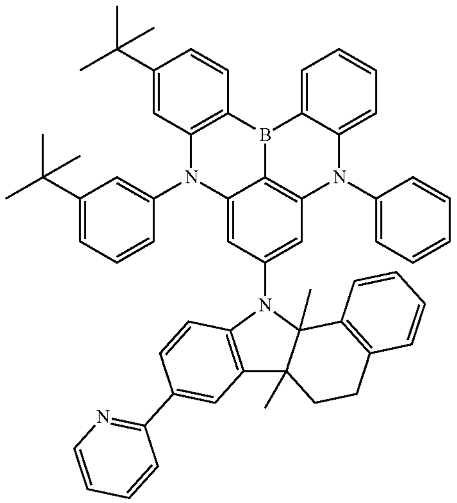
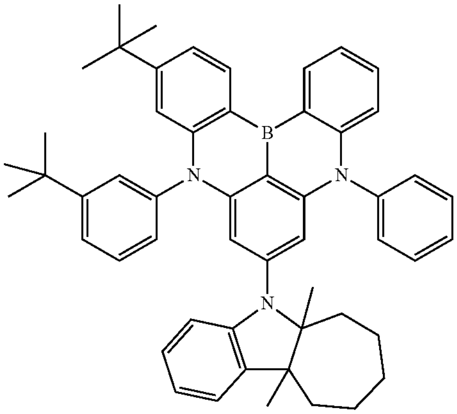
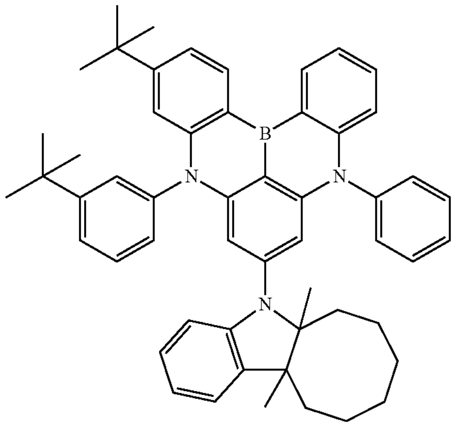

-continued
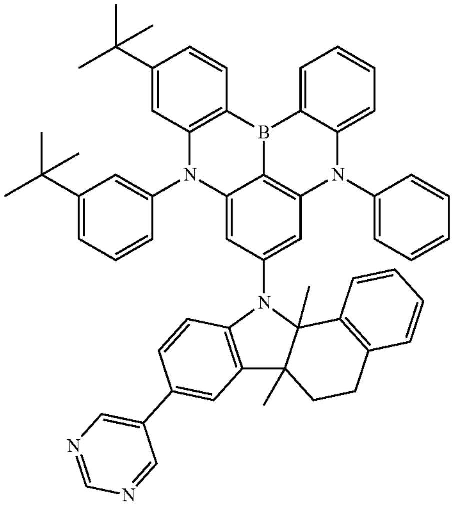
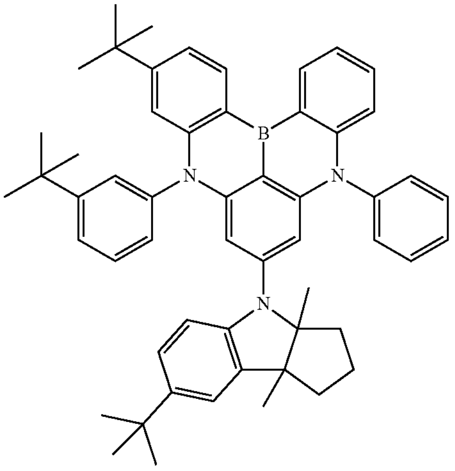
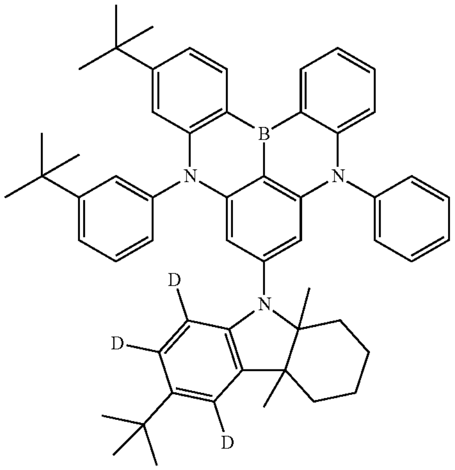
-continued
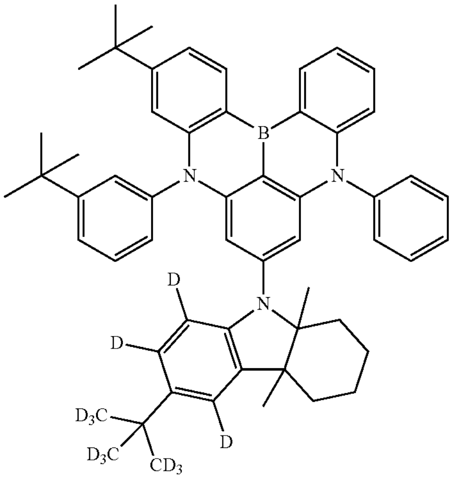
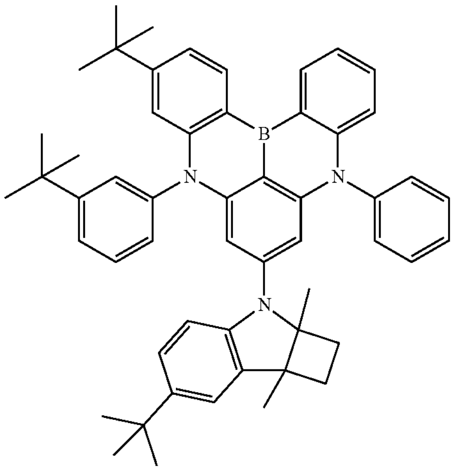
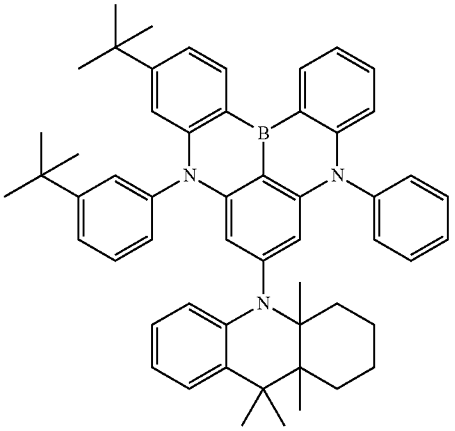

-continued
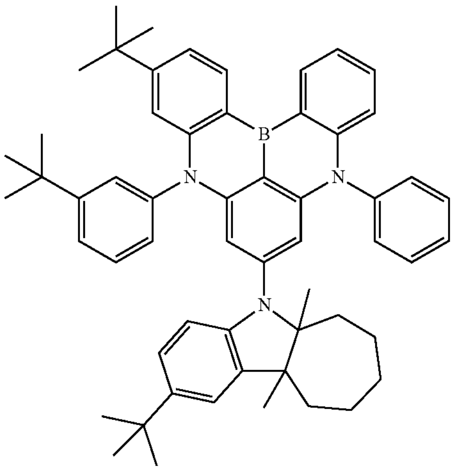
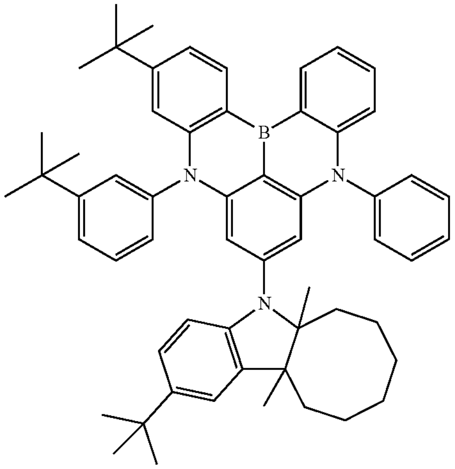
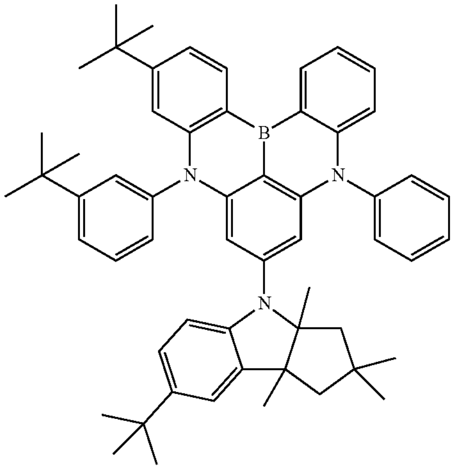
-continued
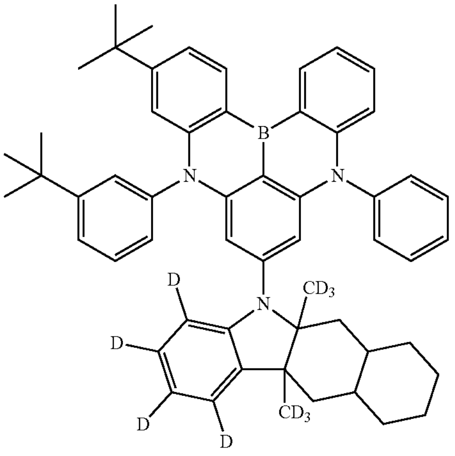
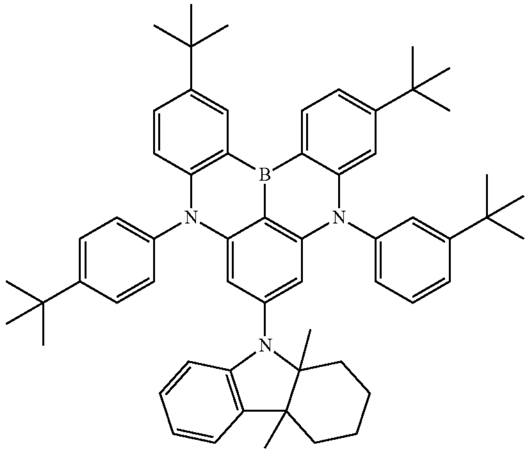
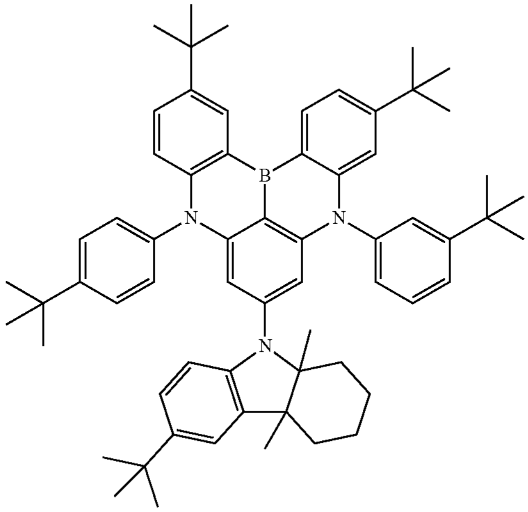

-continued
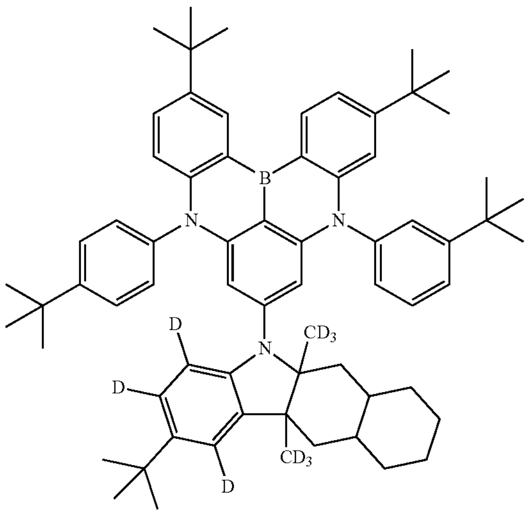
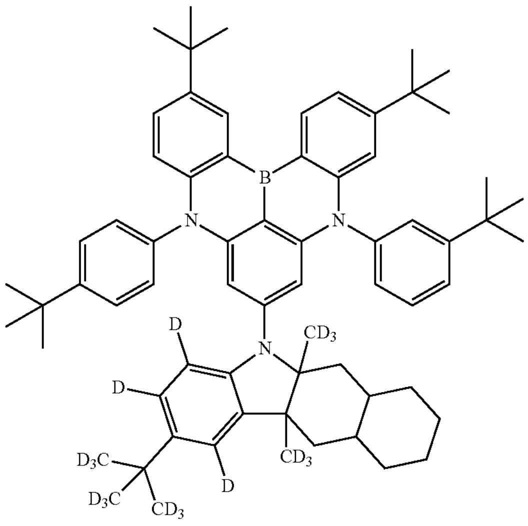
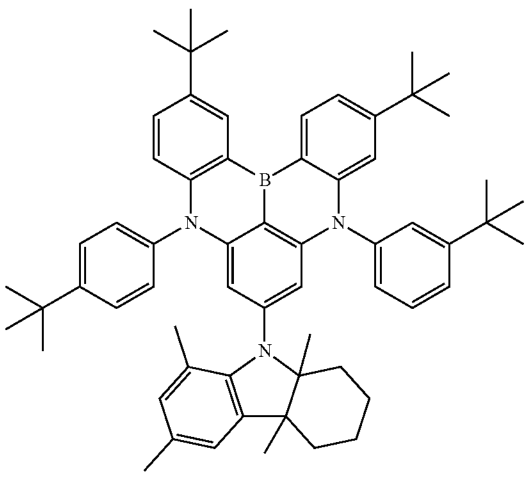
-continued
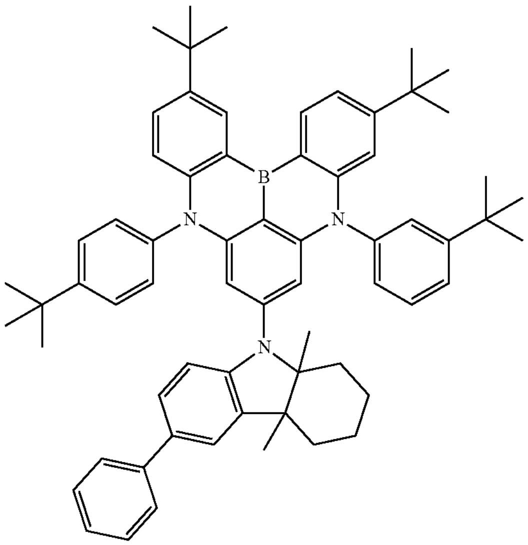
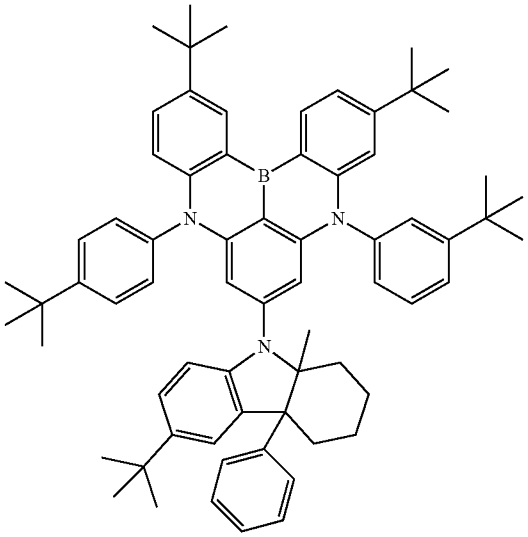
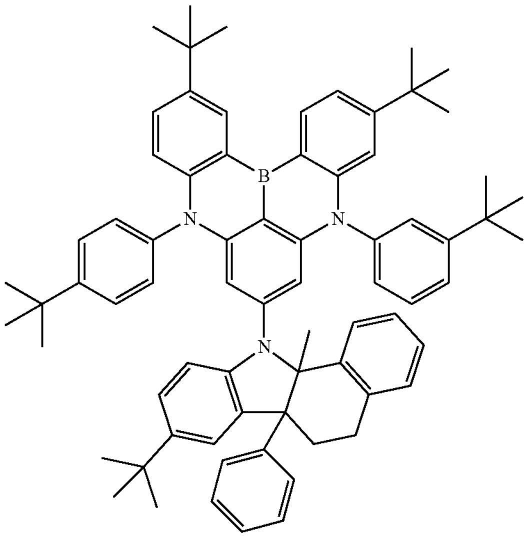

-continued
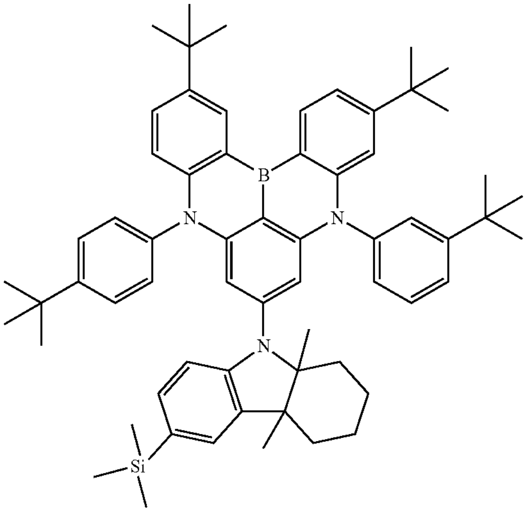
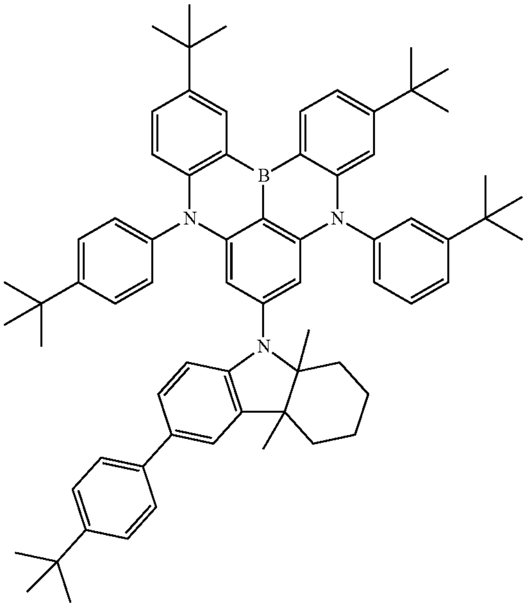
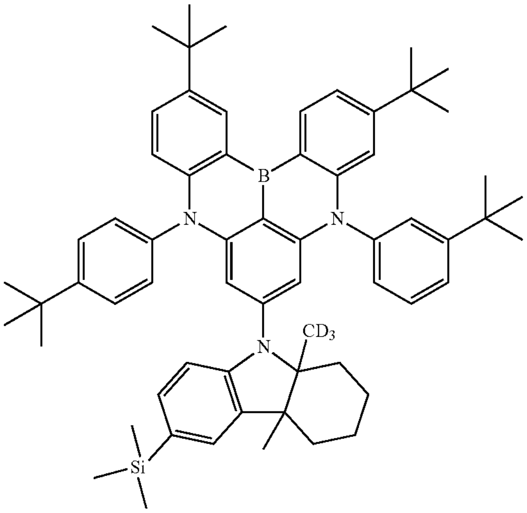
-continued
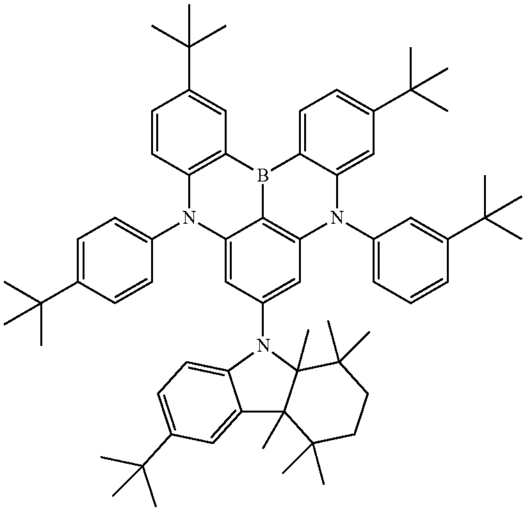
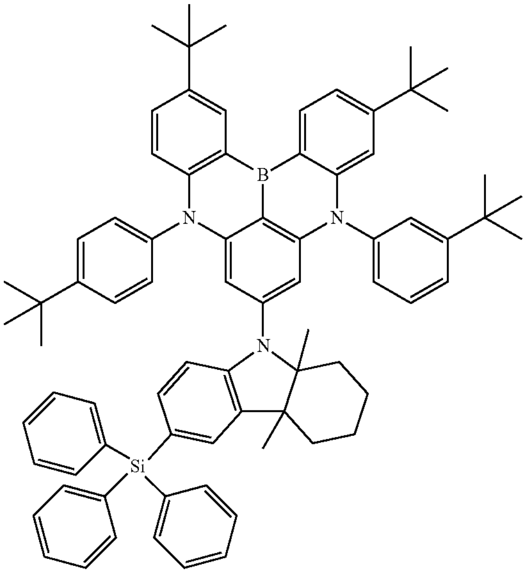
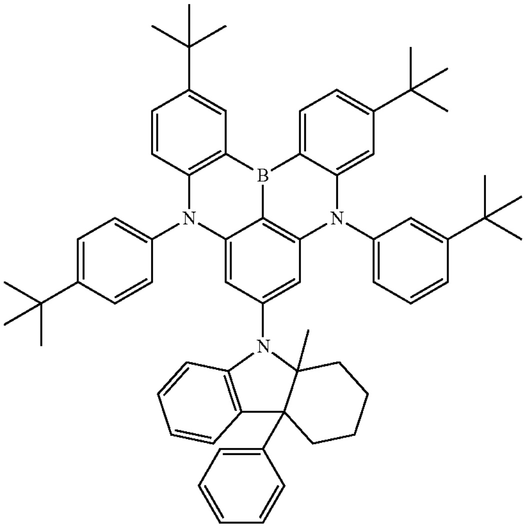

-continued
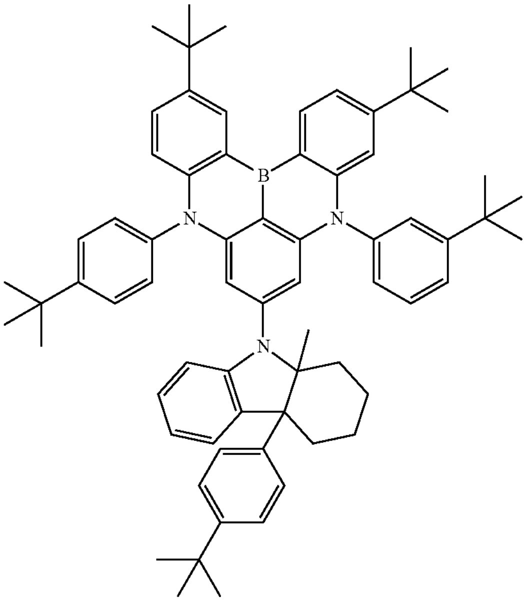
-continued
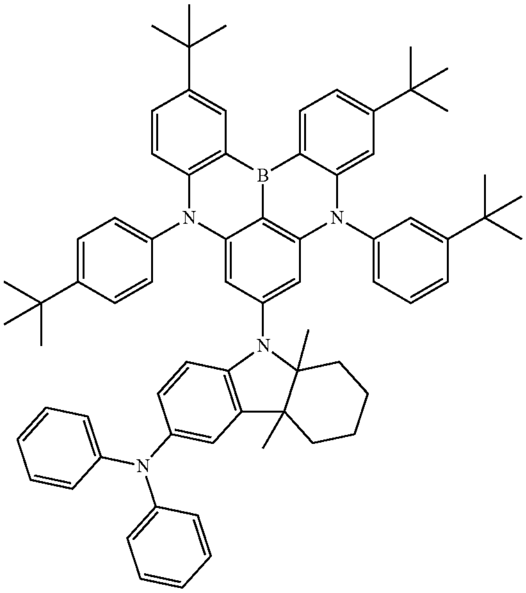
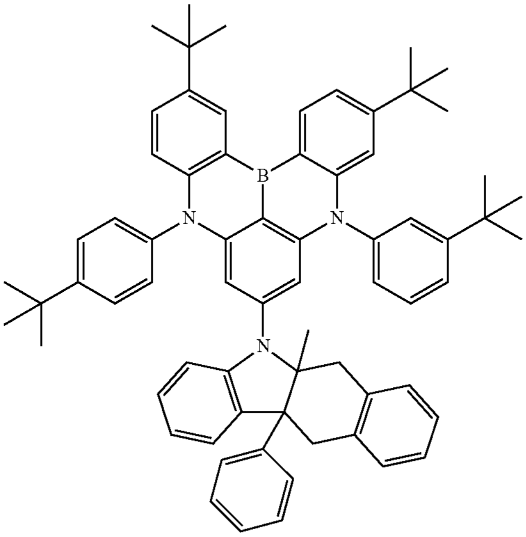
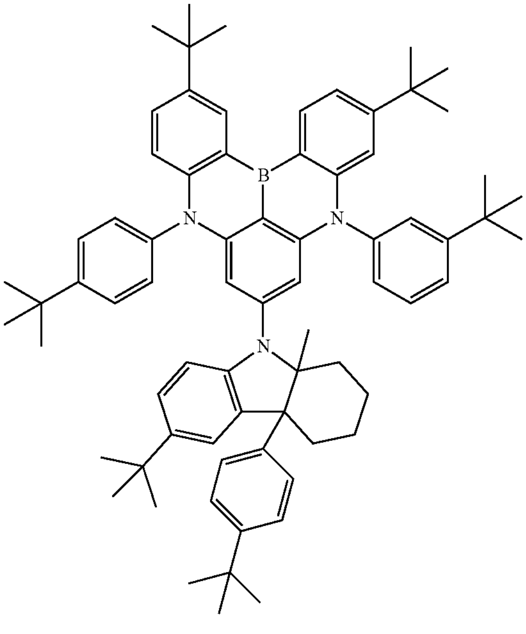
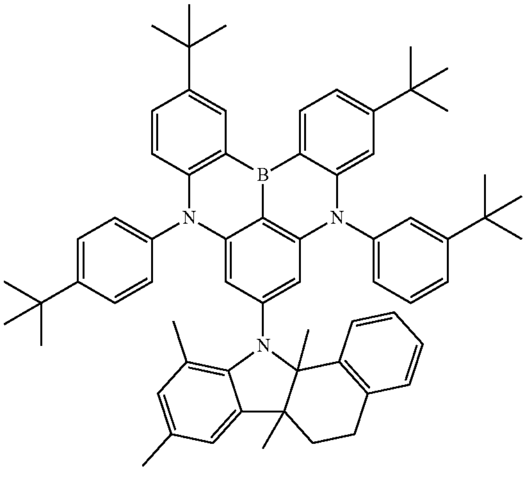

-continued
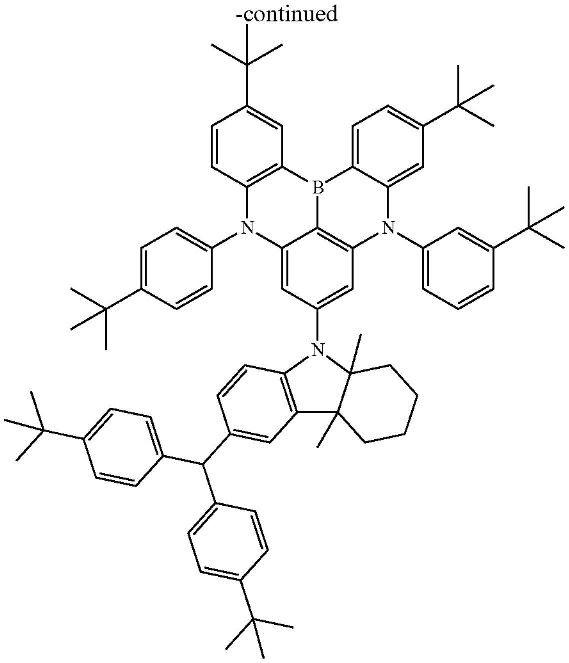
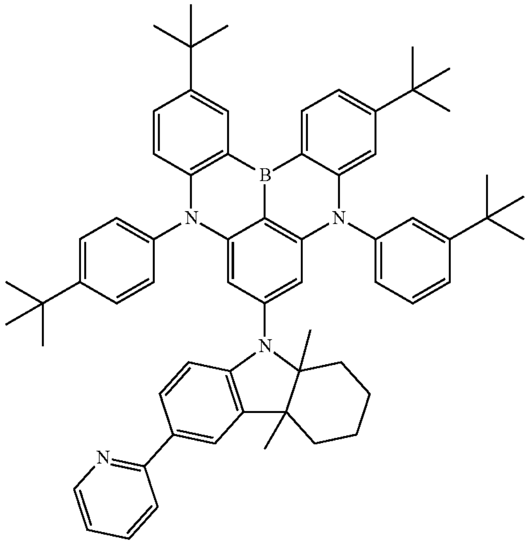
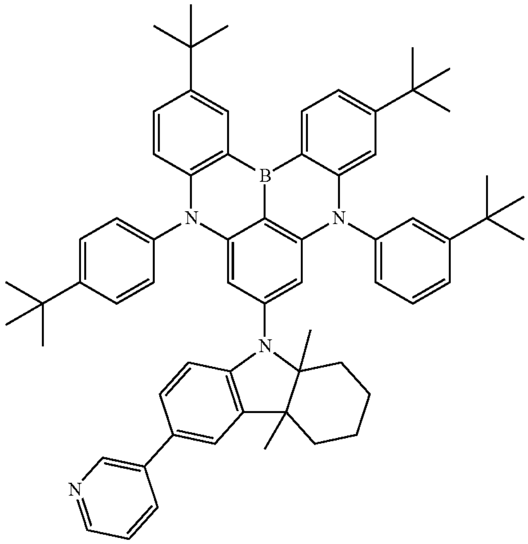
-continued
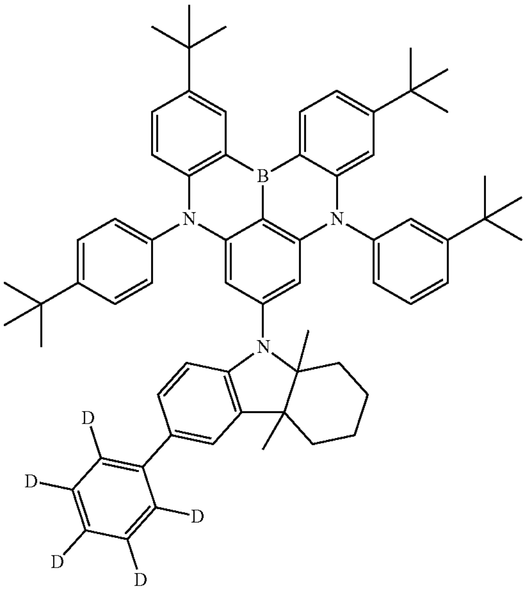
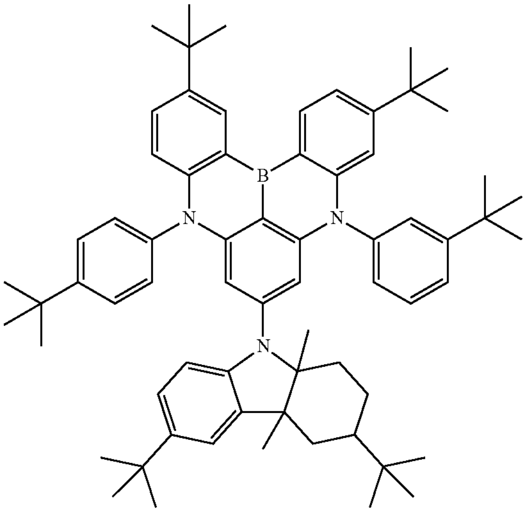
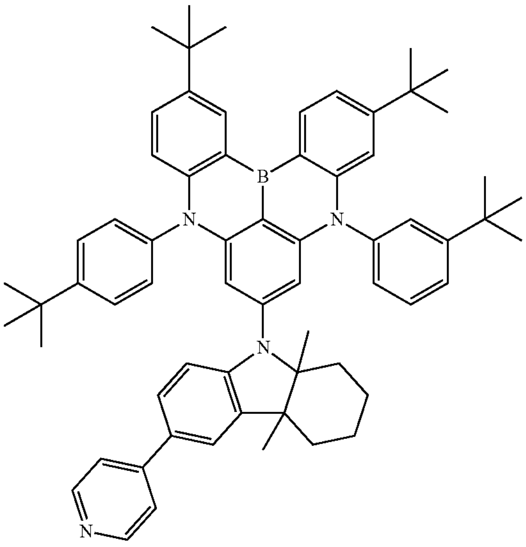

-continued
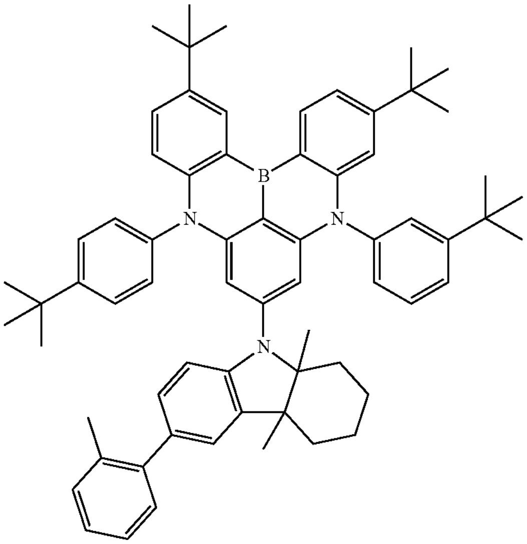
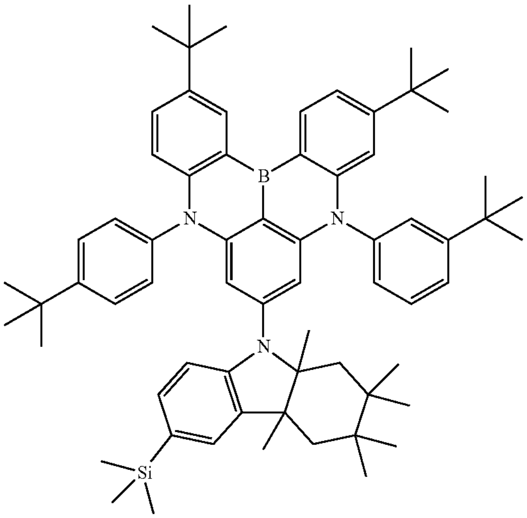
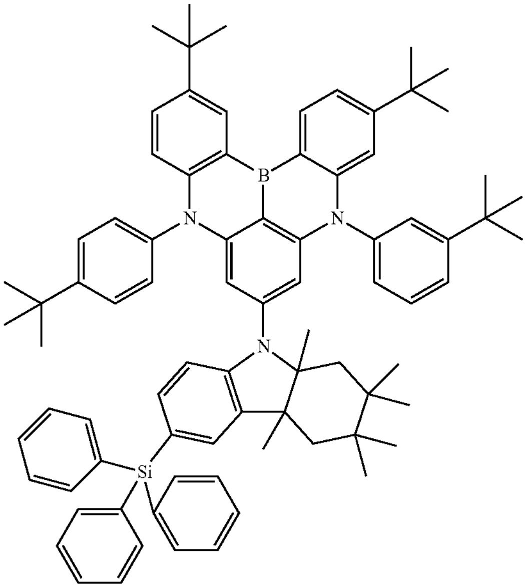
-continued
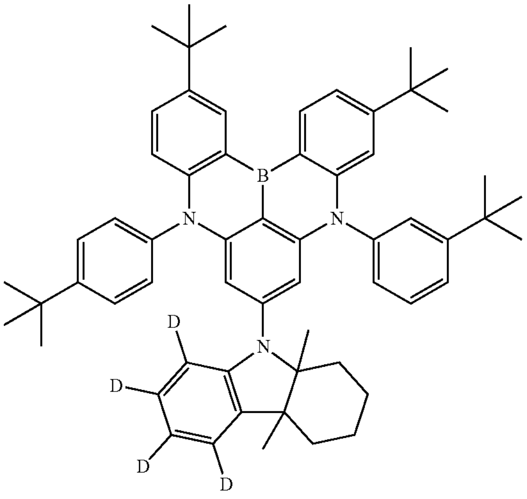
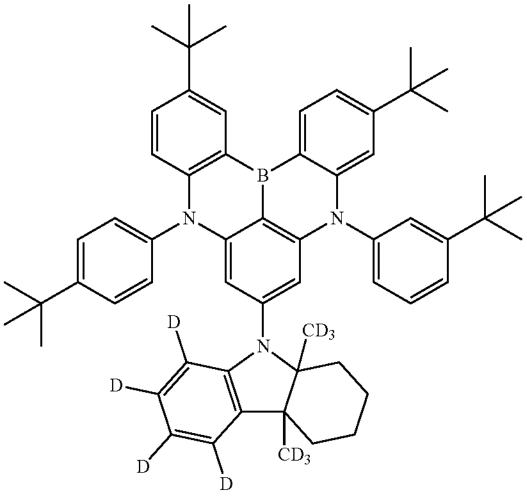
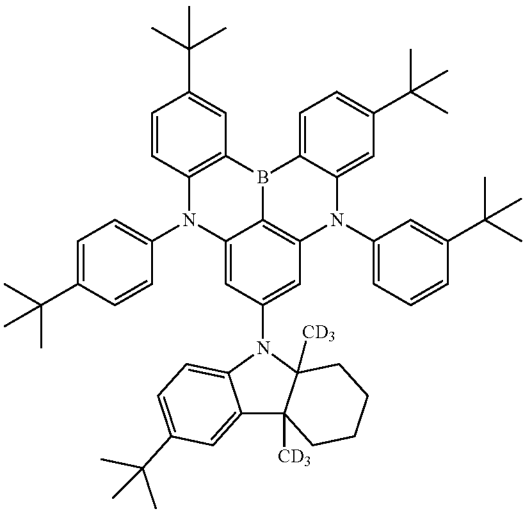

-continued
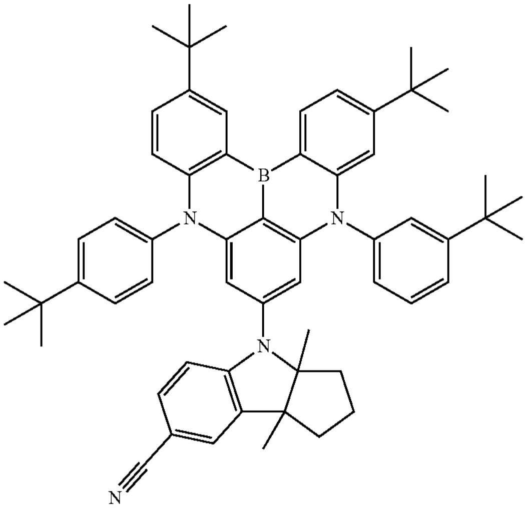
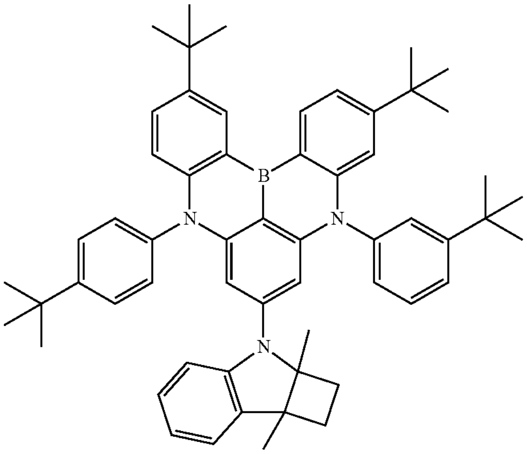
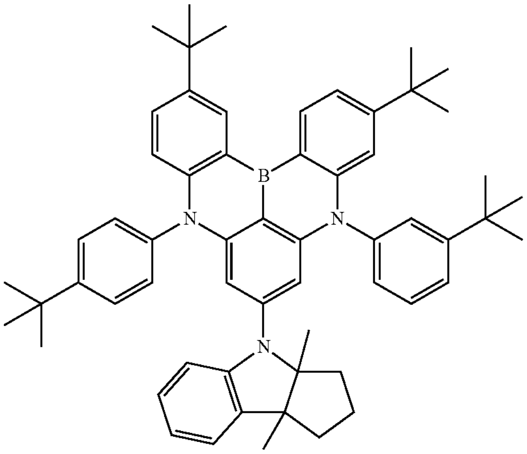
-continued
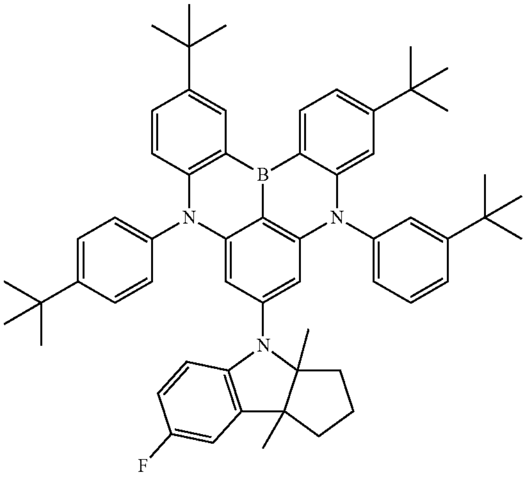
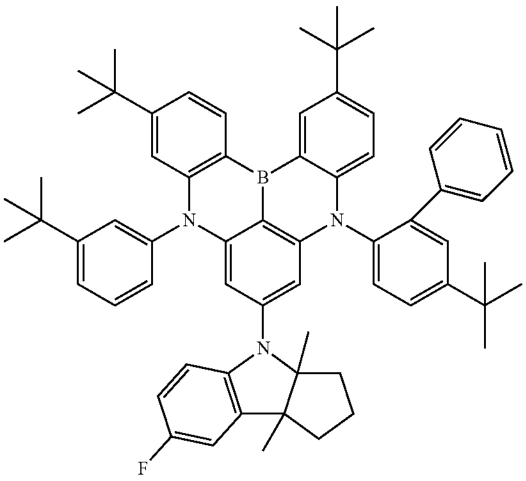
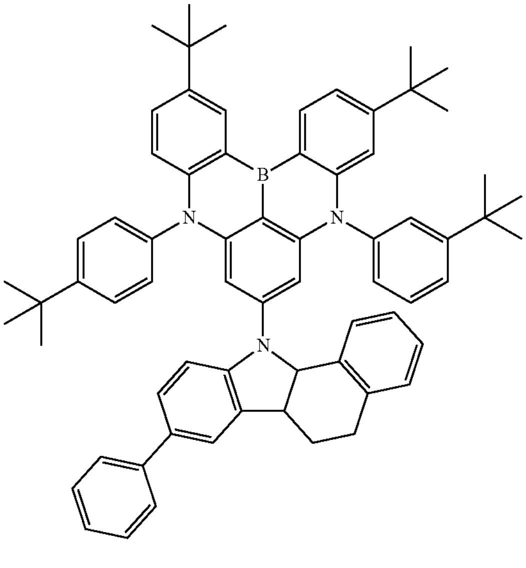

-continued
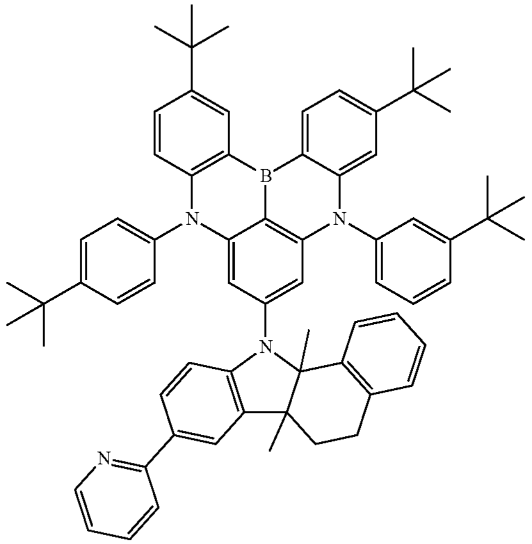
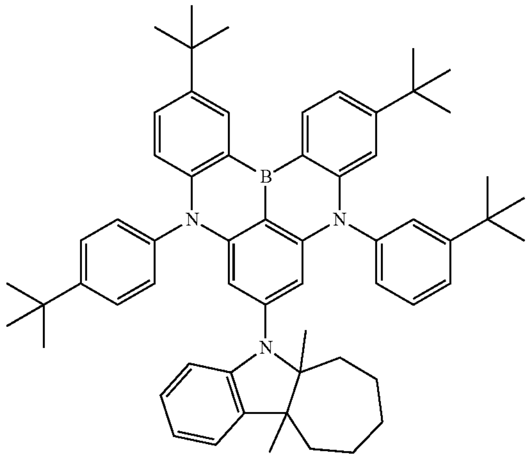
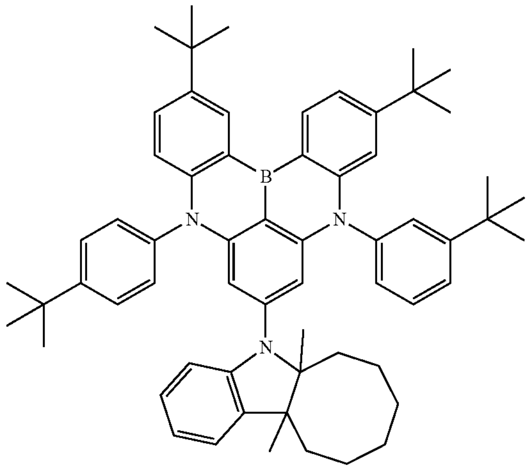
-continued
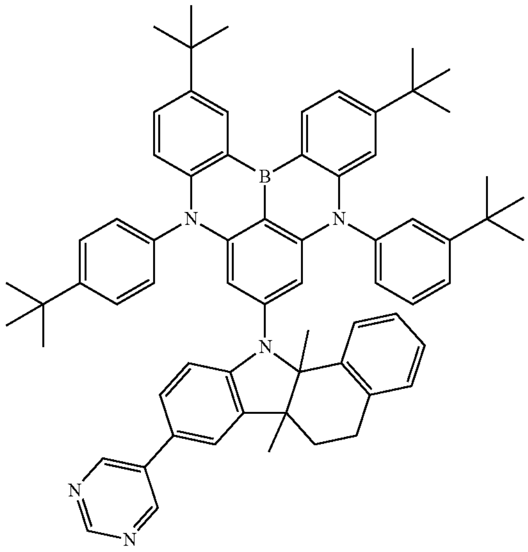
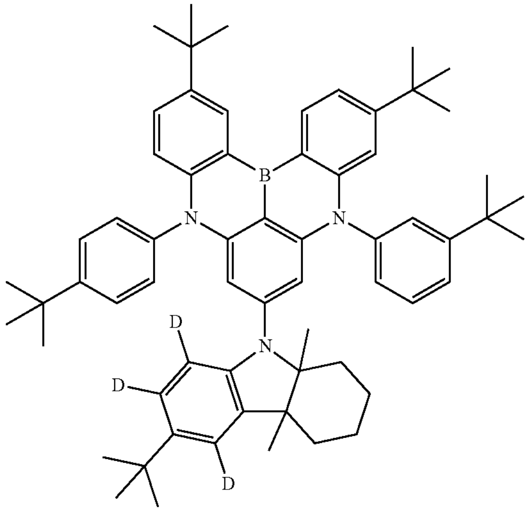
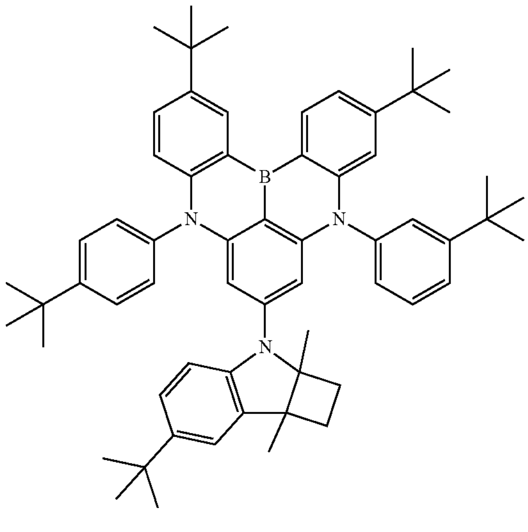

-continued
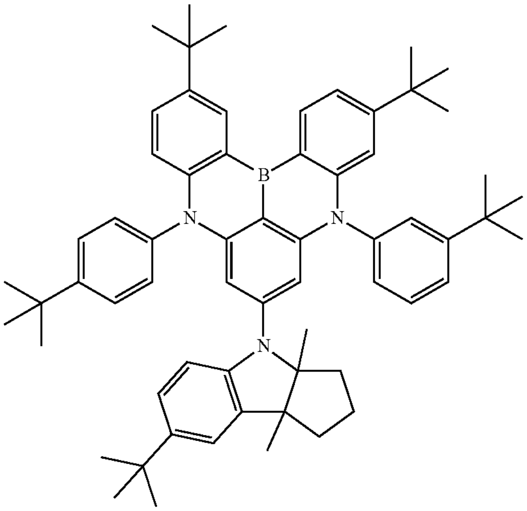
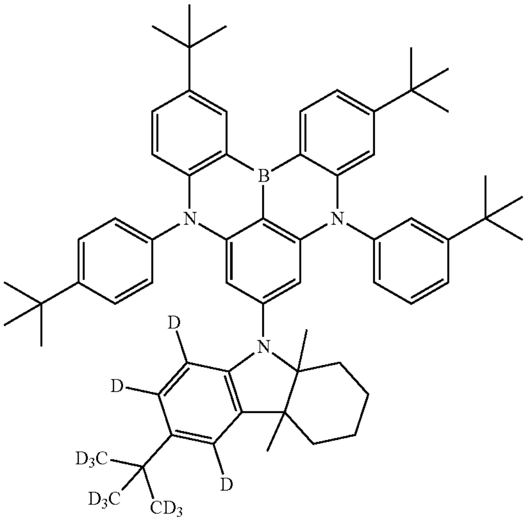
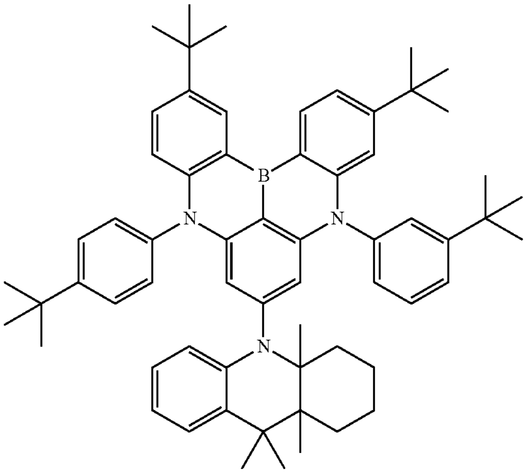
-continued
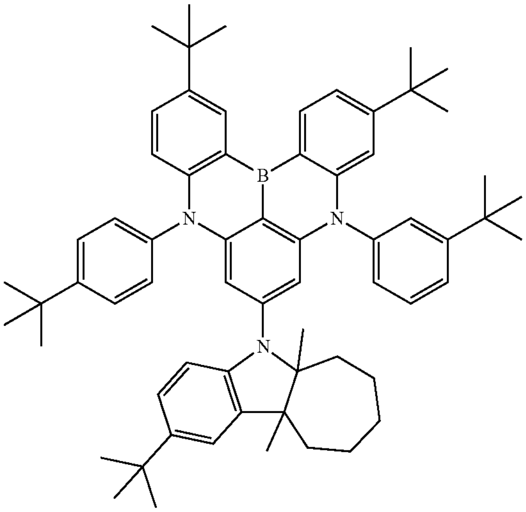
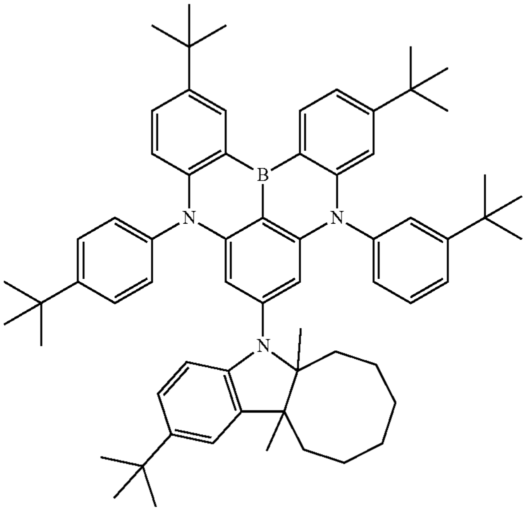
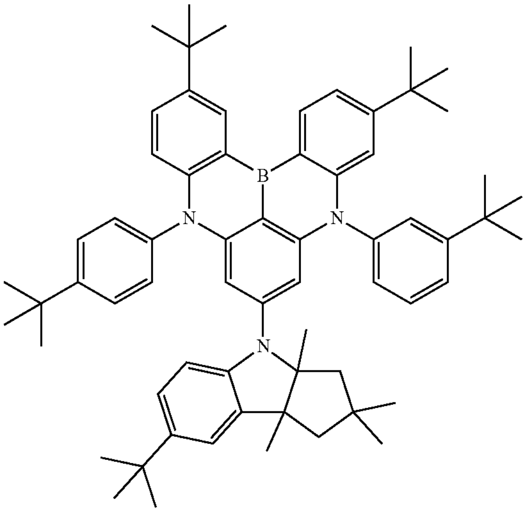

-continued
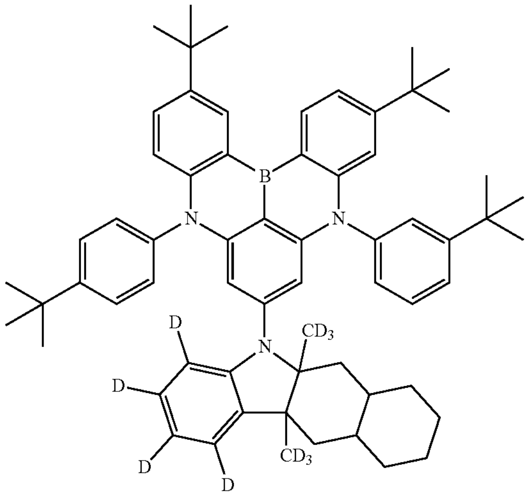
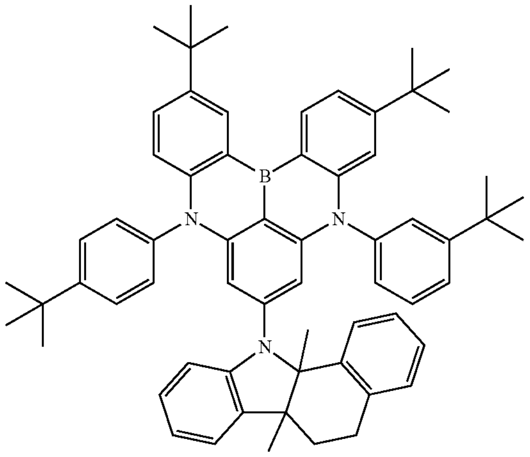
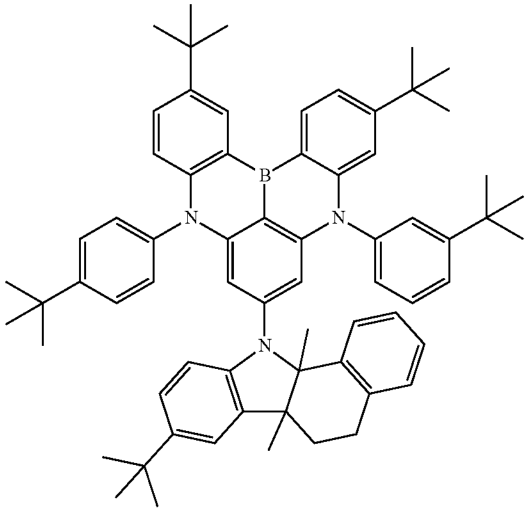
-continued
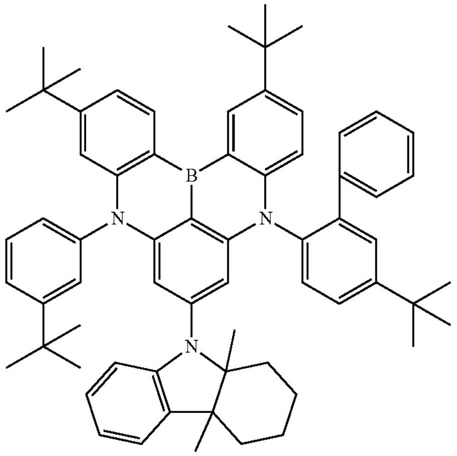
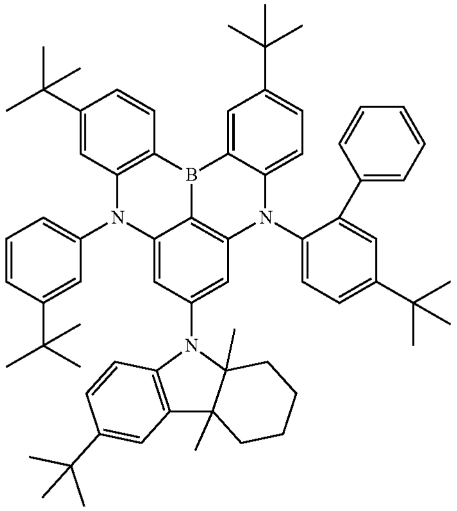
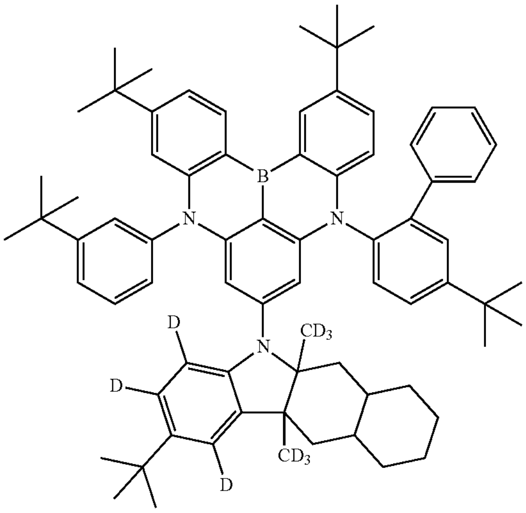

-continued
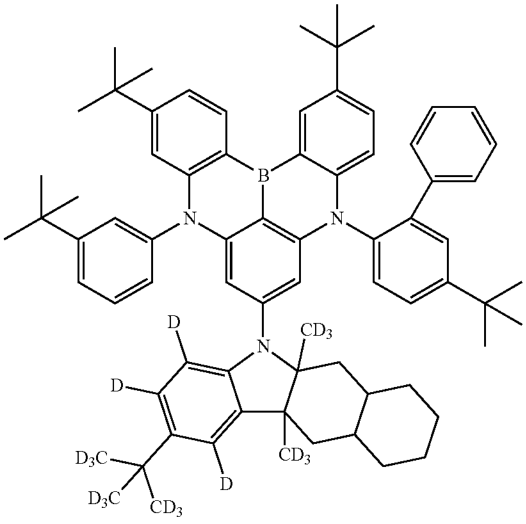
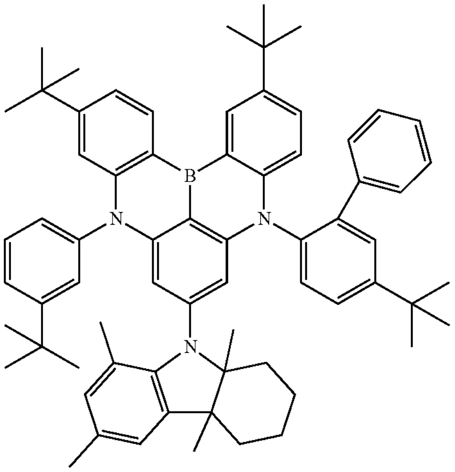
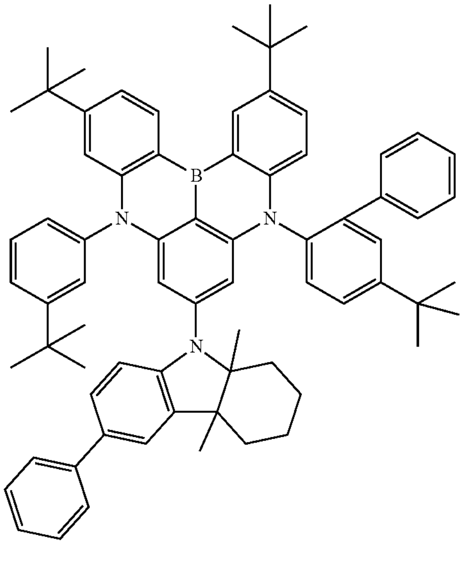
-continued
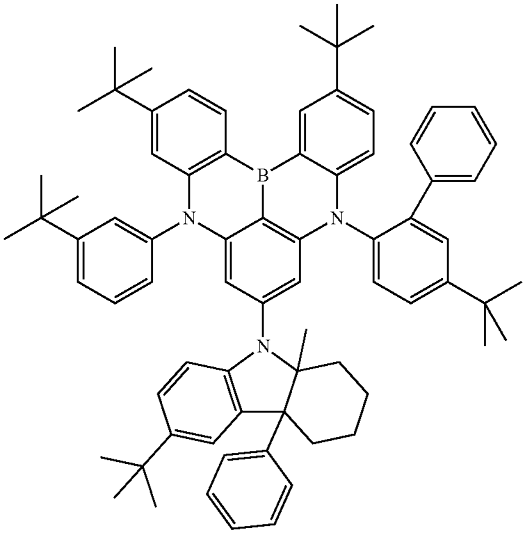
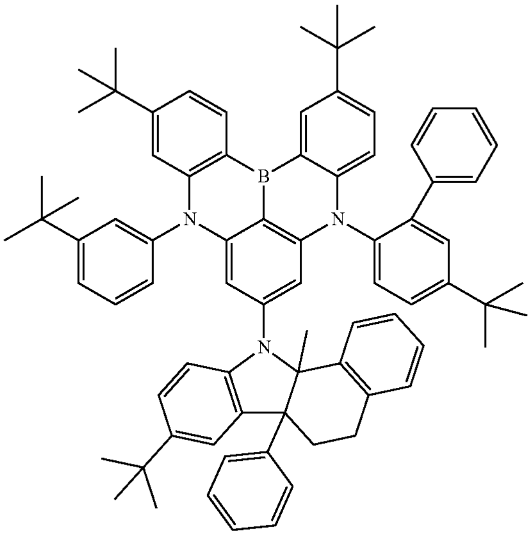
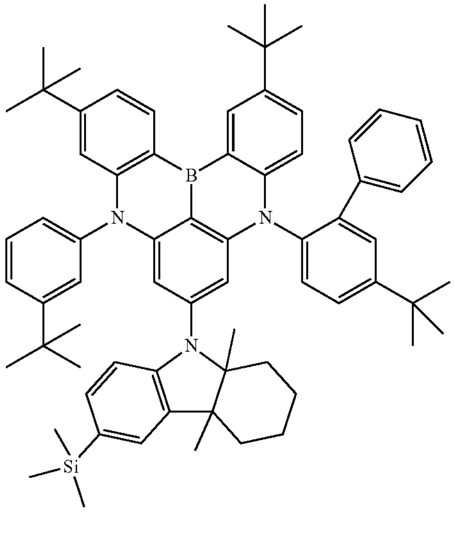

-continued
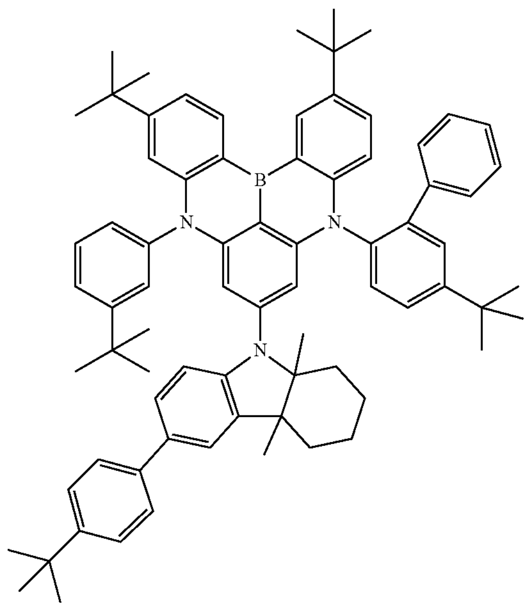
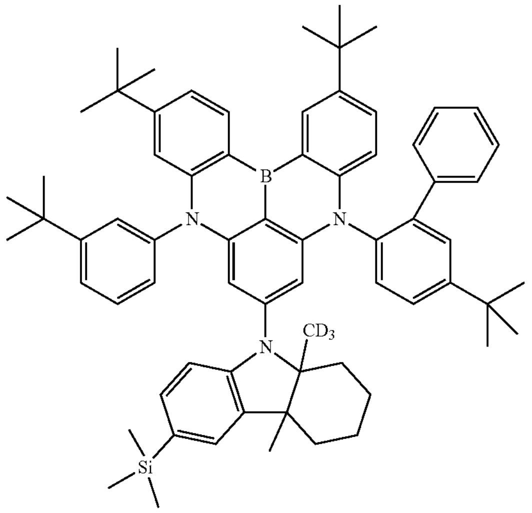
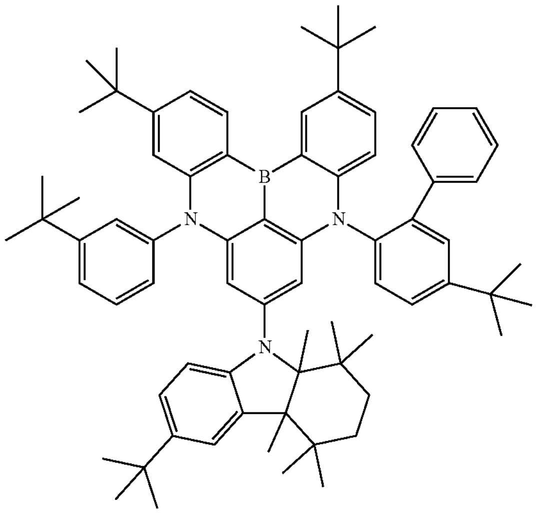
-continued
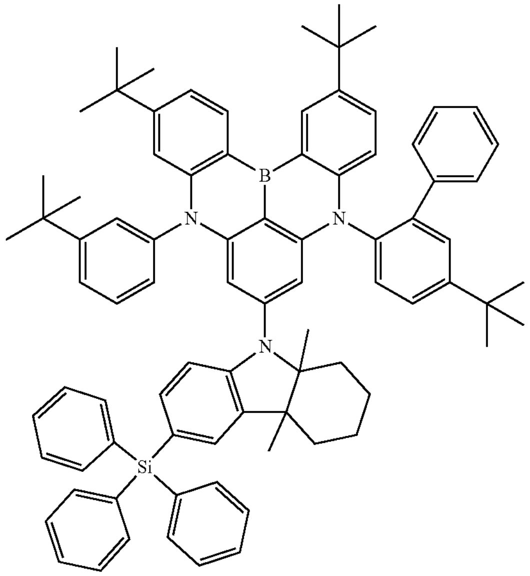
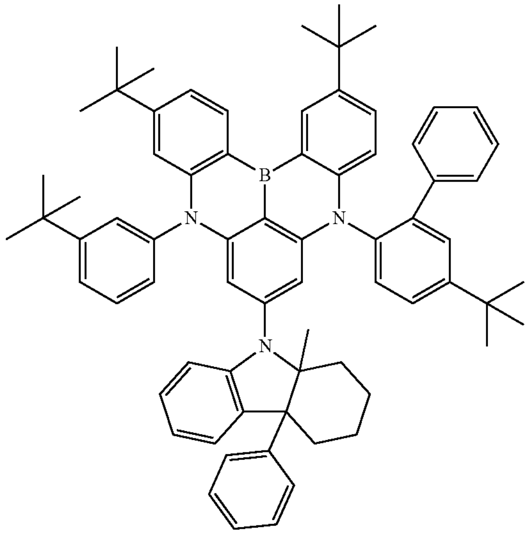
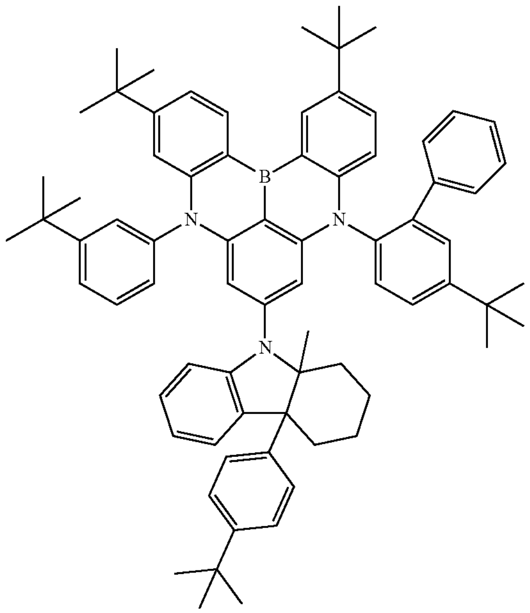

-continued
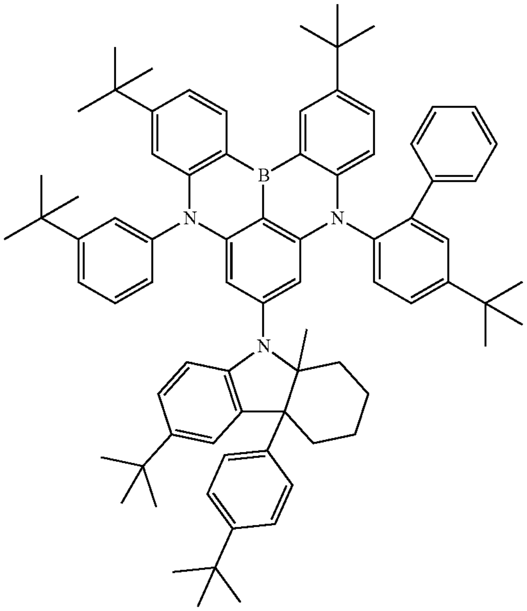
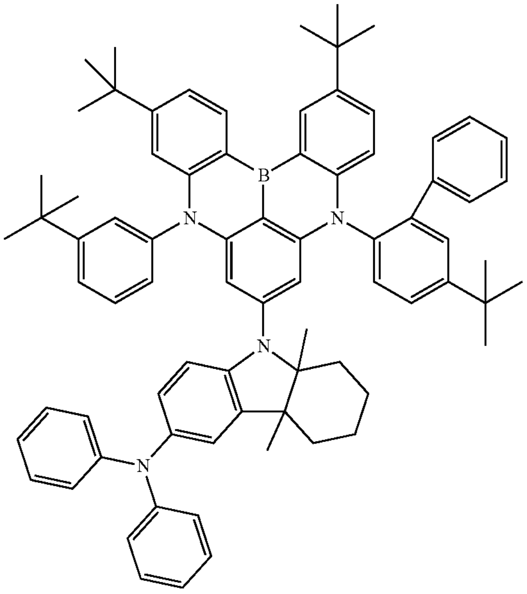
-continued
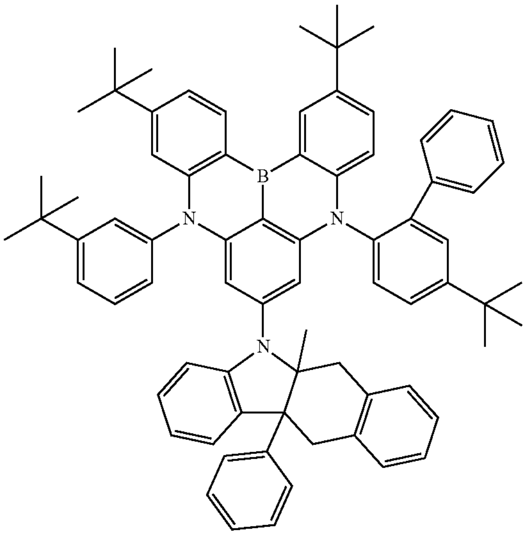
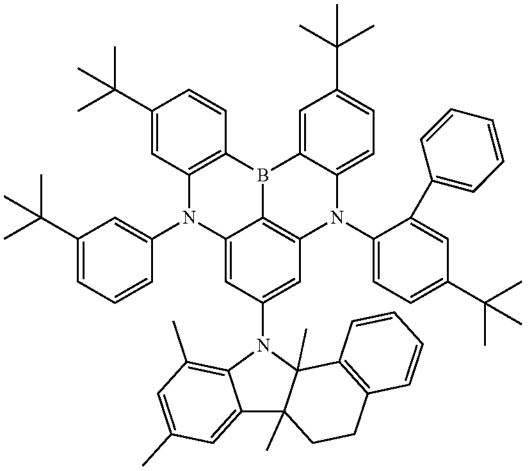
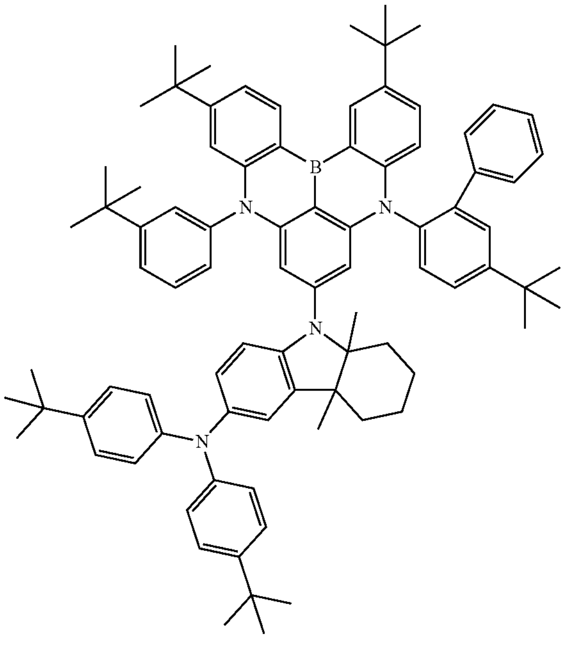

-continued
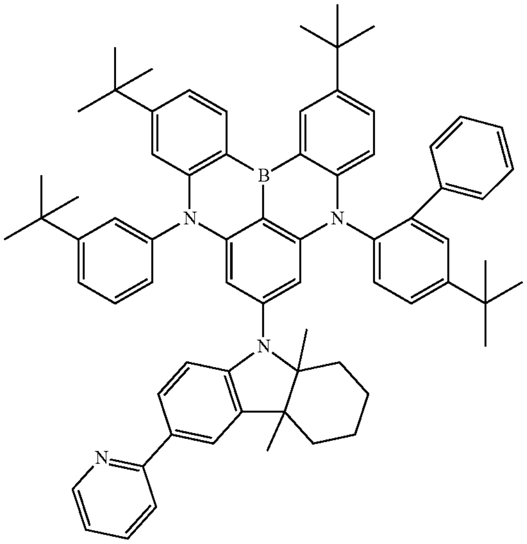
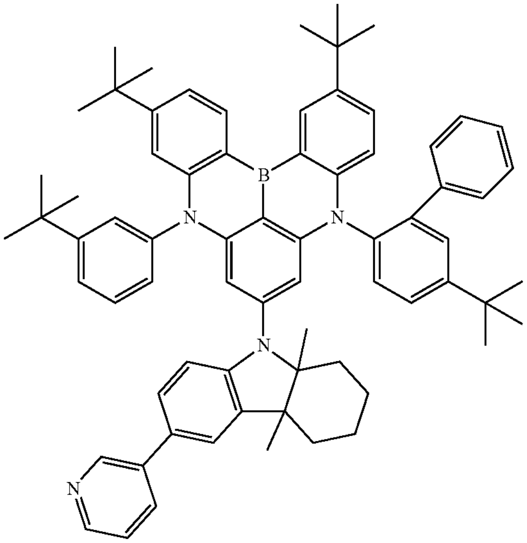
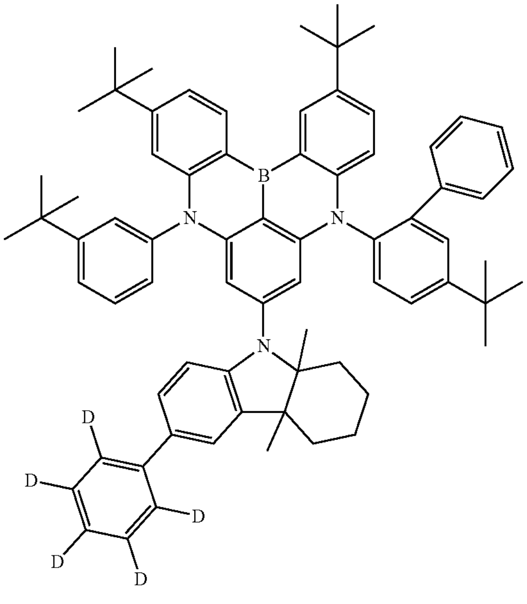
-continued
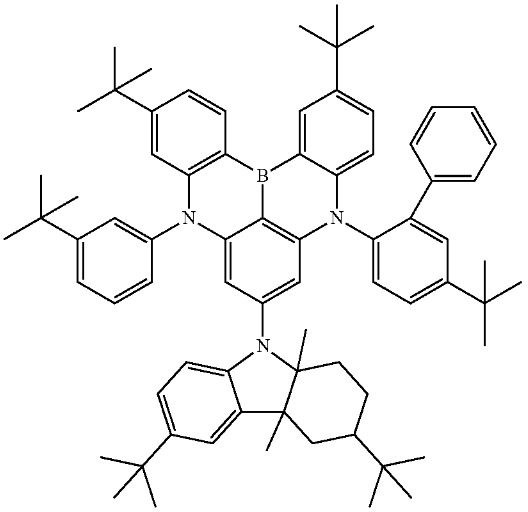
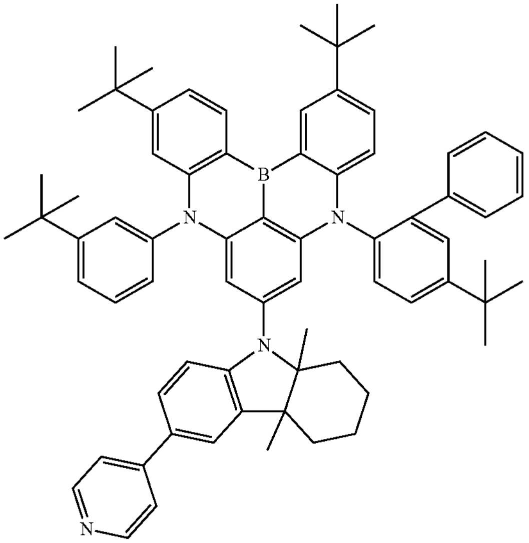
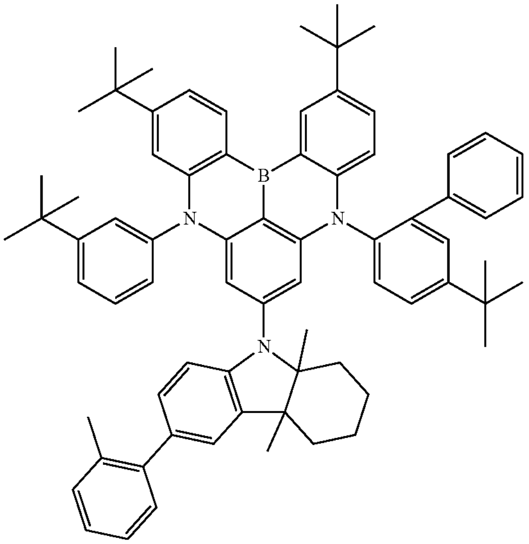

-continued
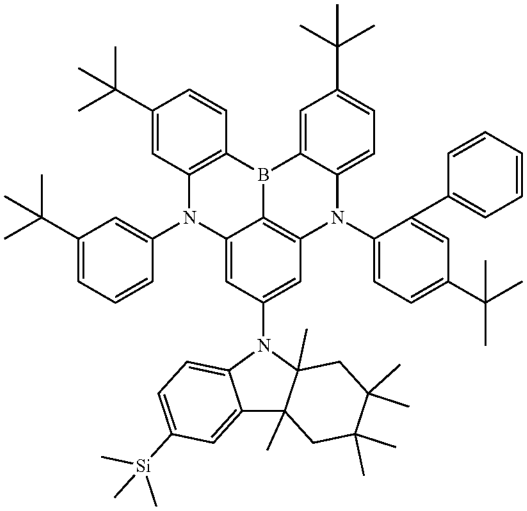
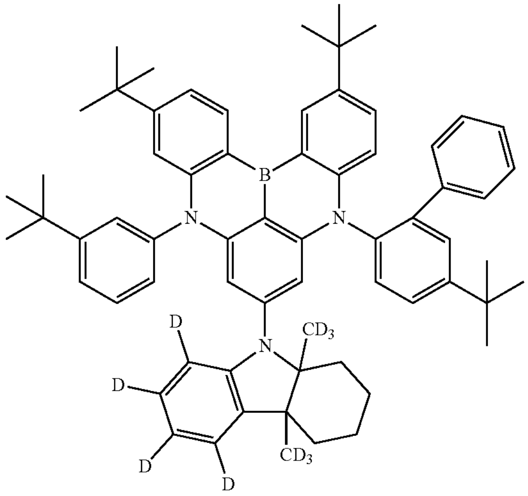
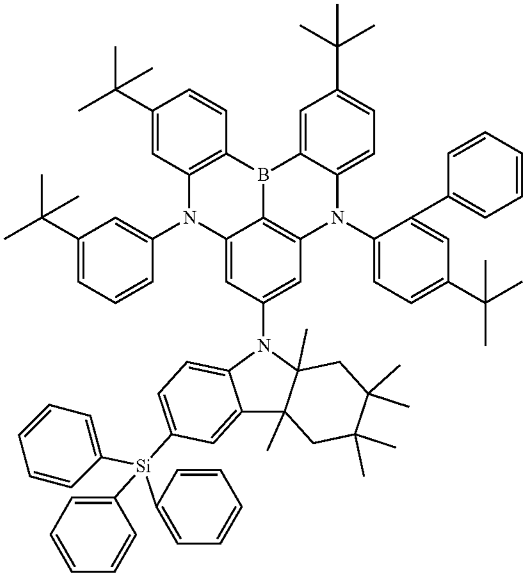
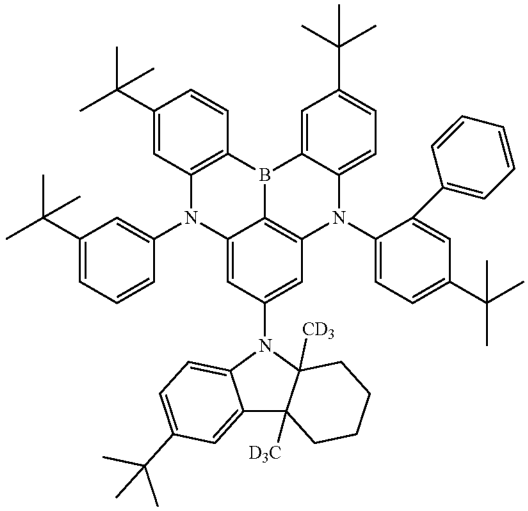
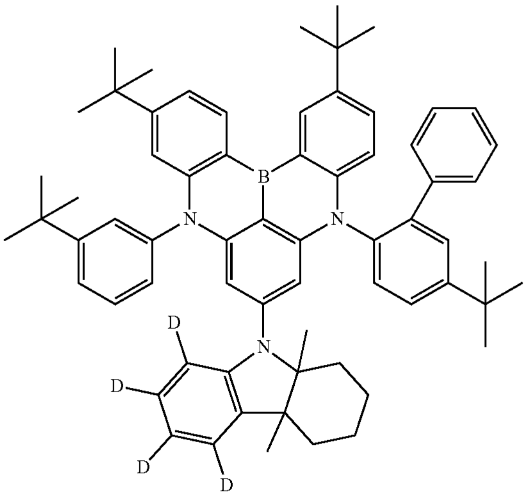
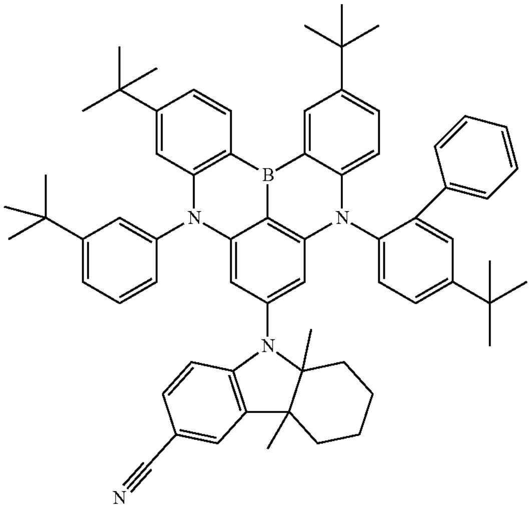
-continued -continued
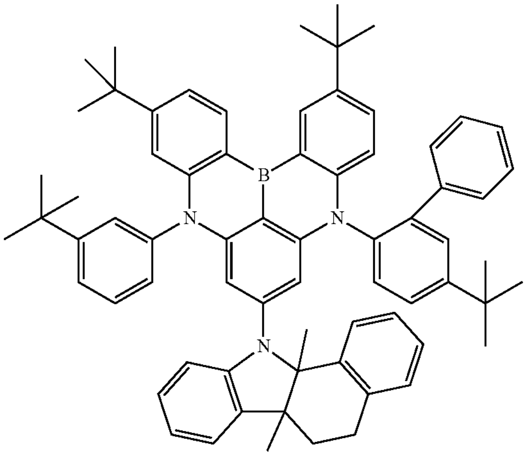
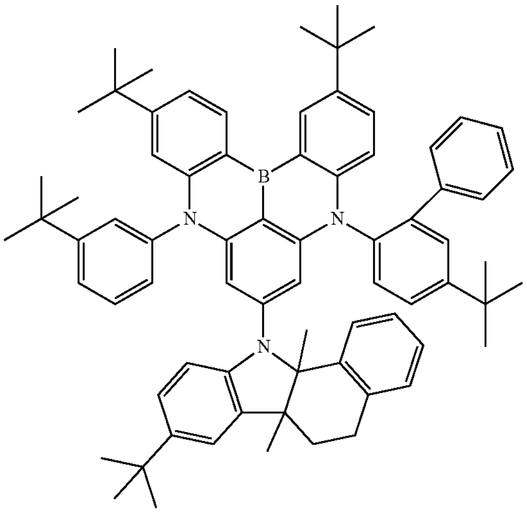
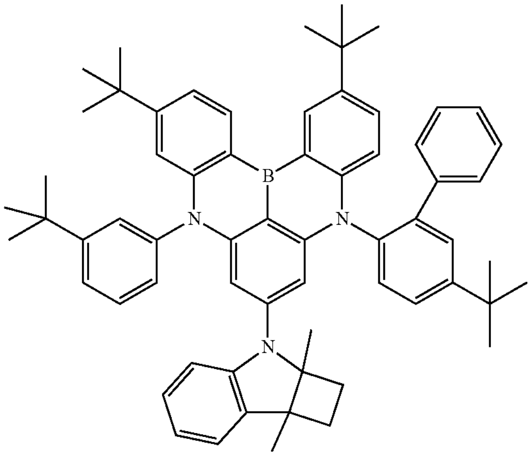
-continued
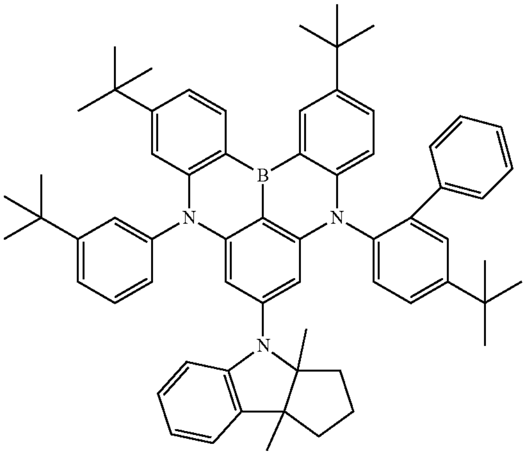
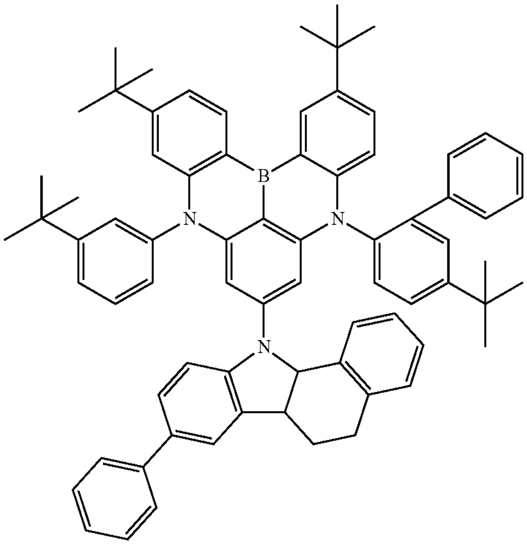
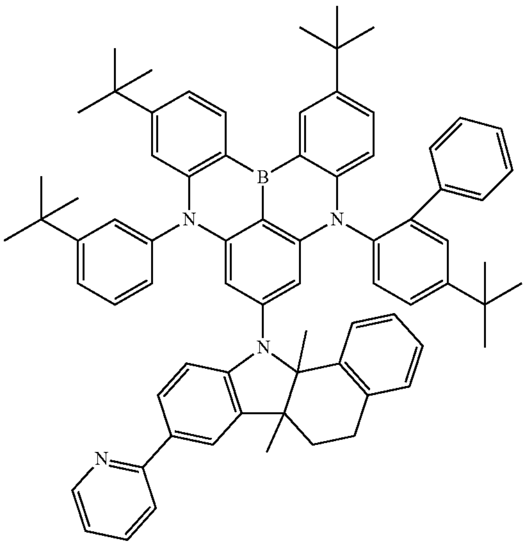

-continued
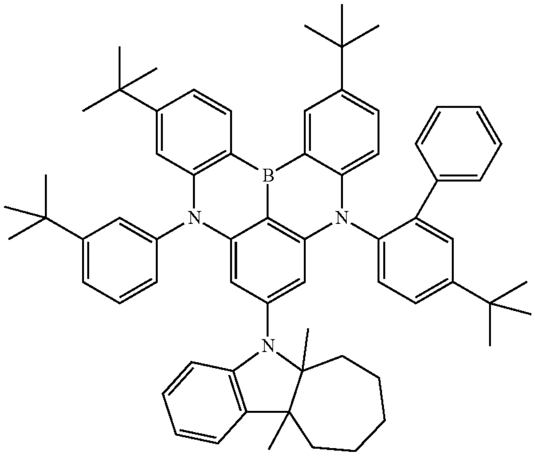
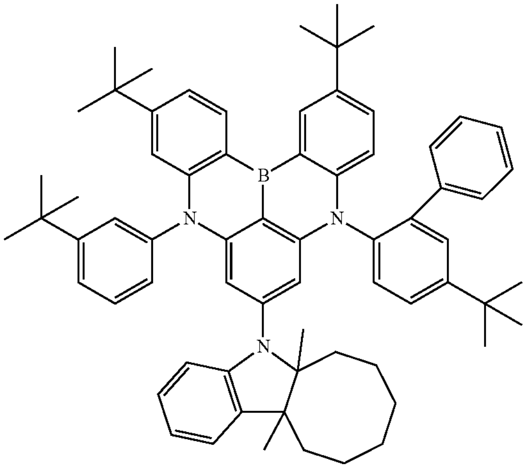
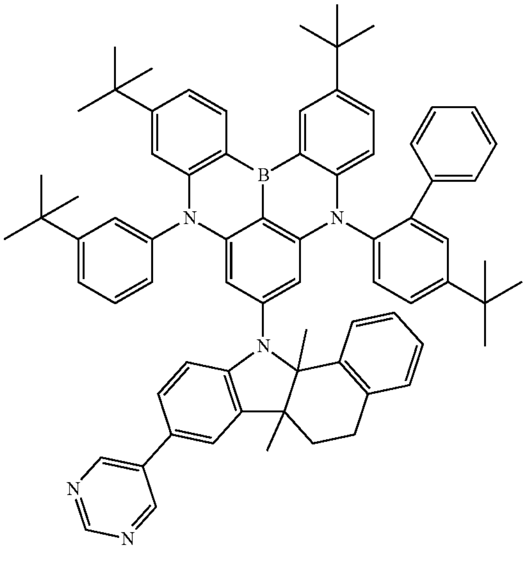
-continued
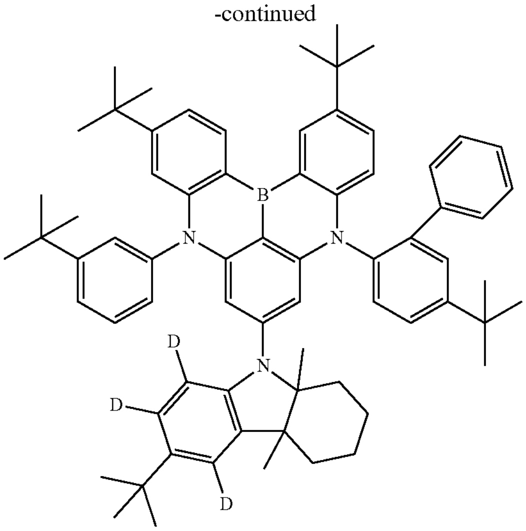
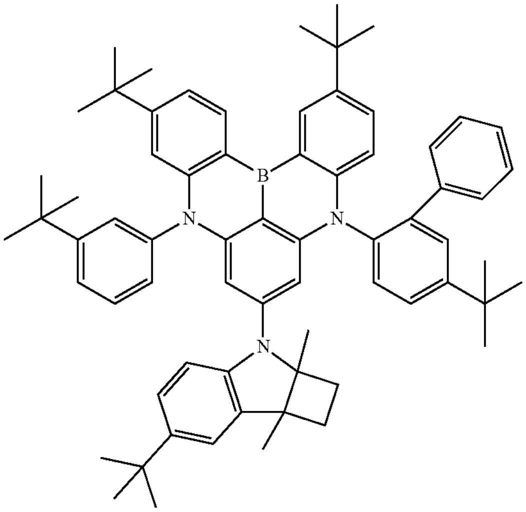
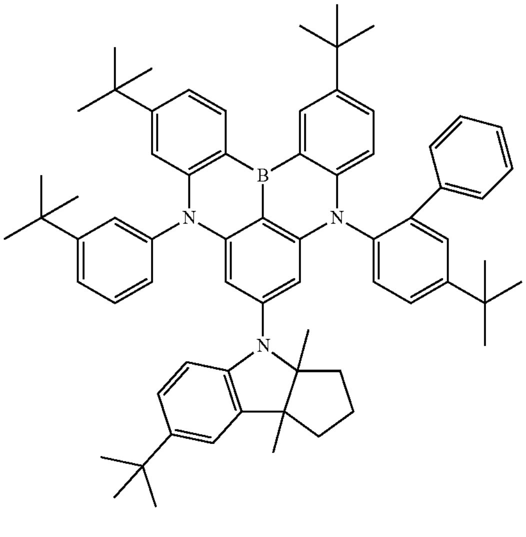

-continued
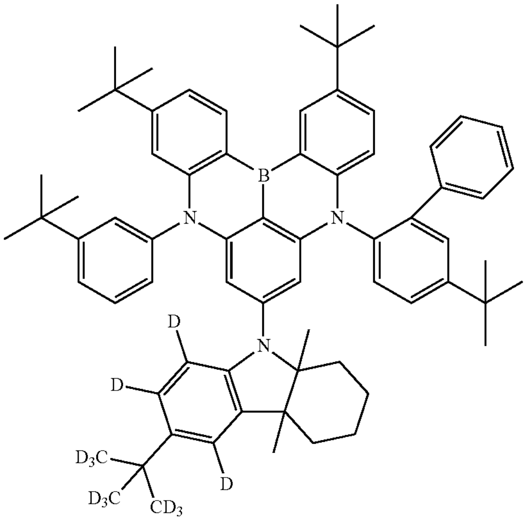
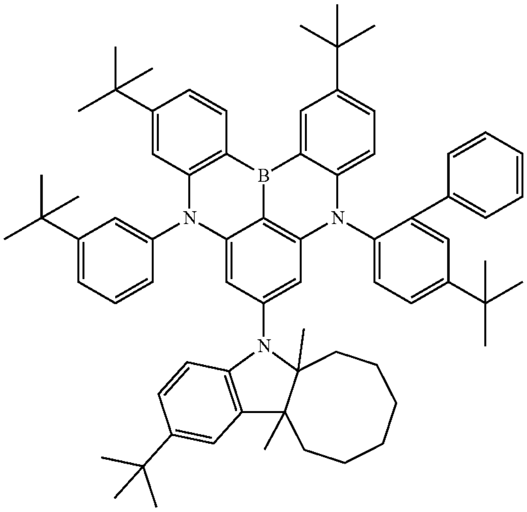
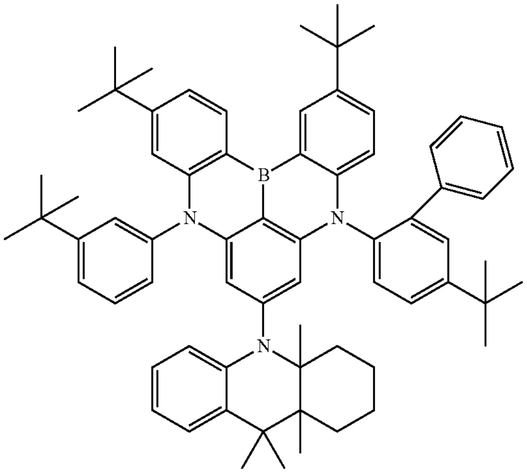
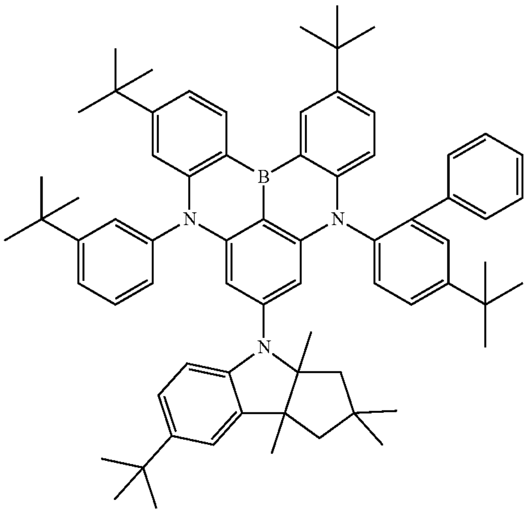
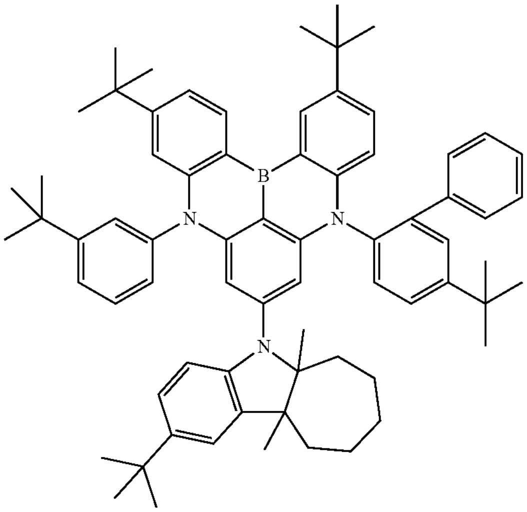
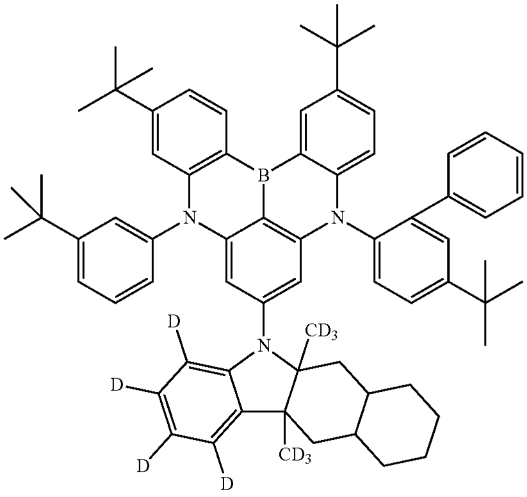

-continued
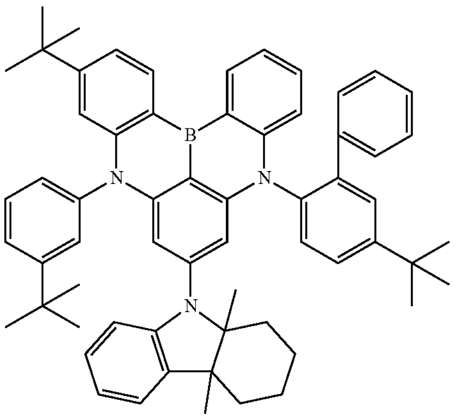
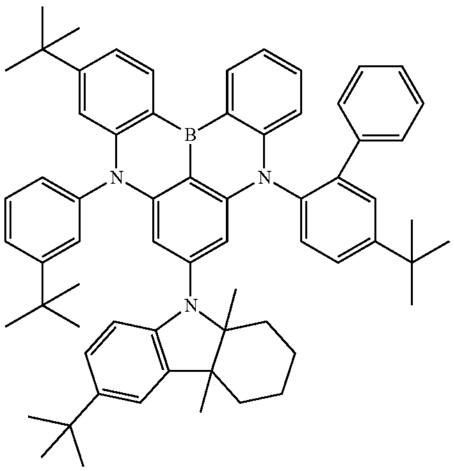
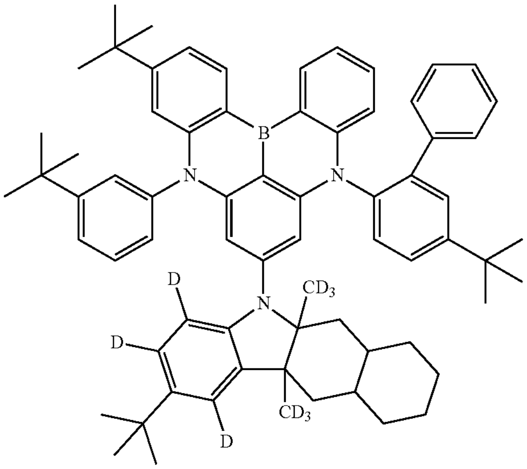
-continued
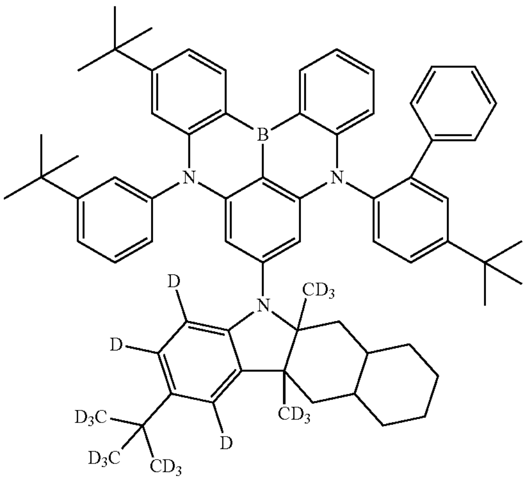
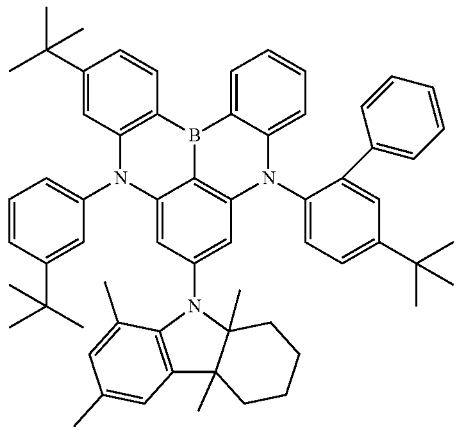
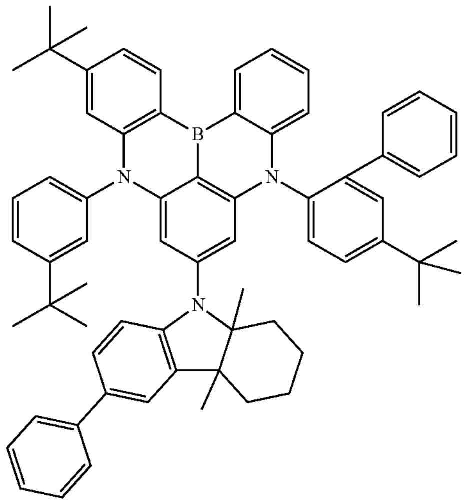

-continued
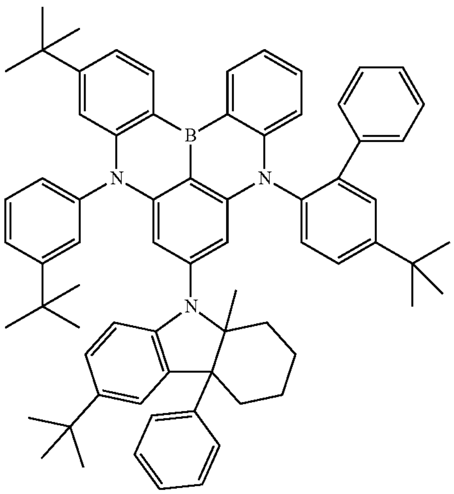
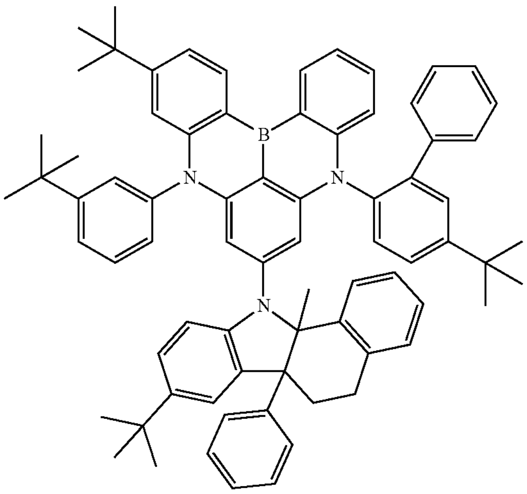
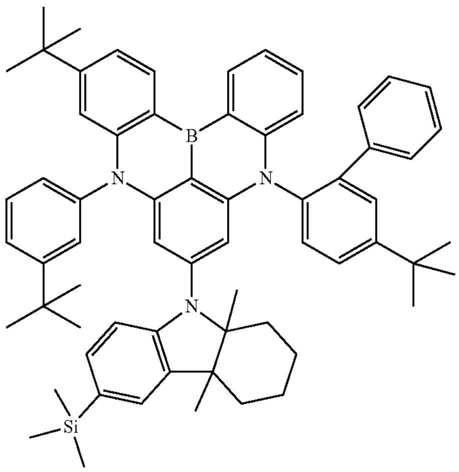
-continued
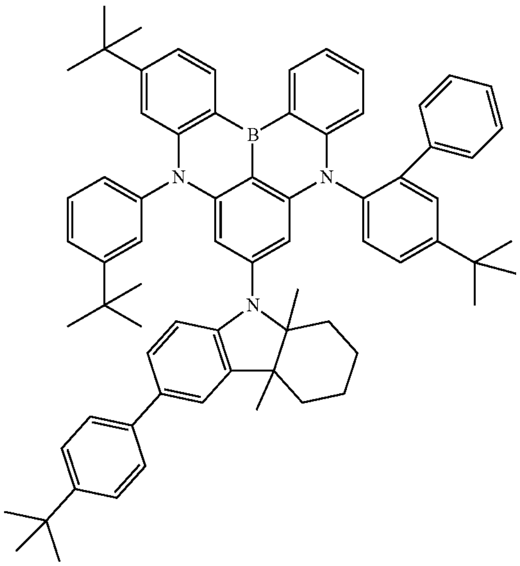
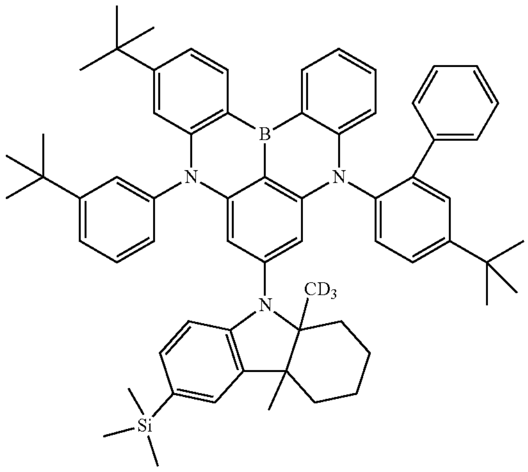
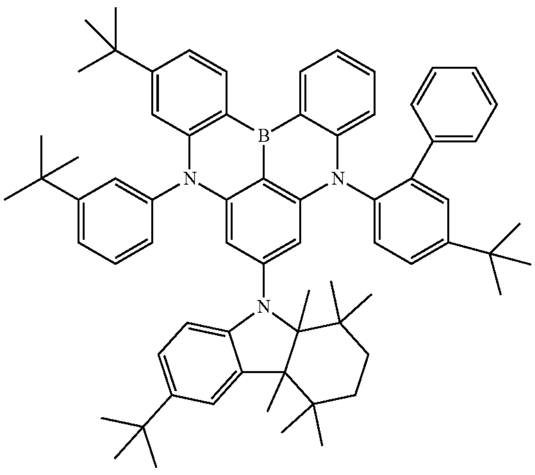

-continued
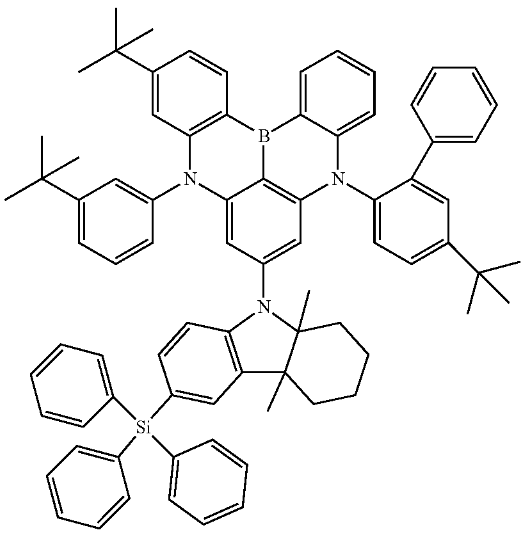
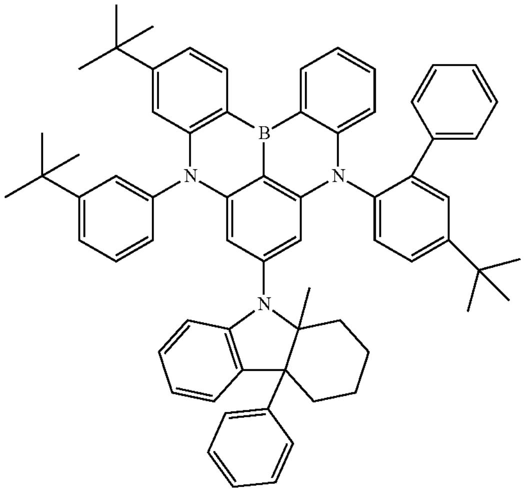
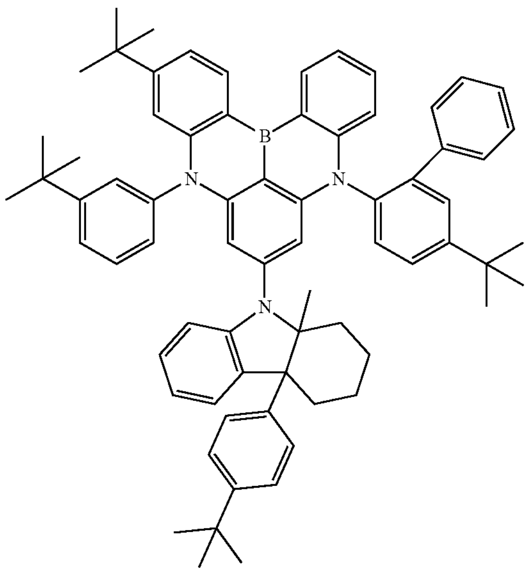
-continued
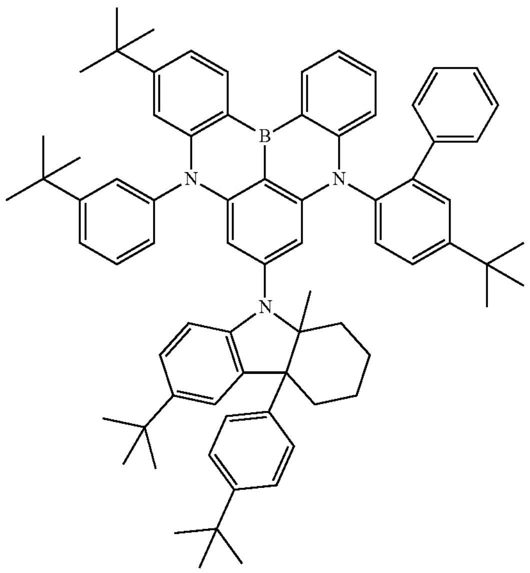
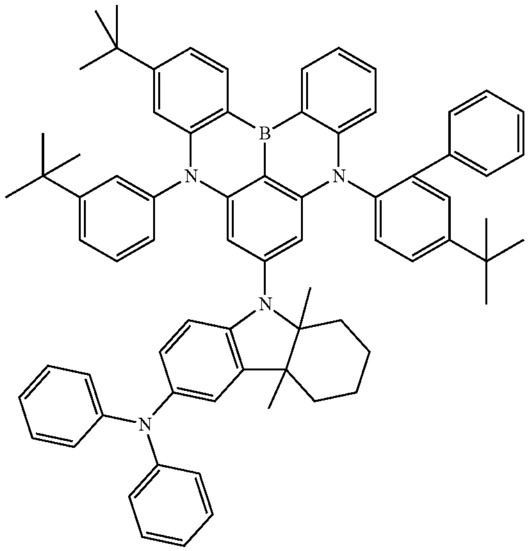
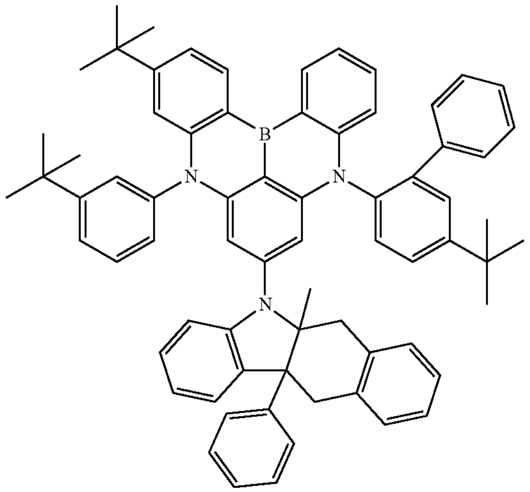

-continued
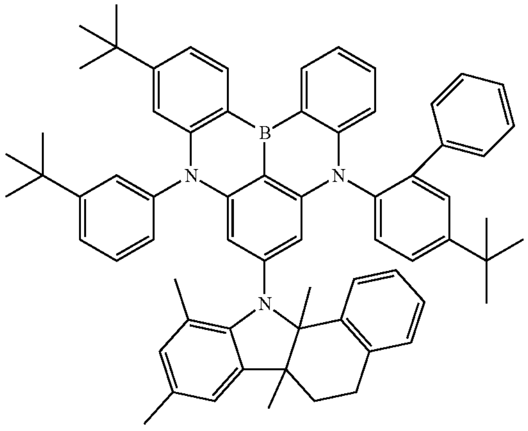
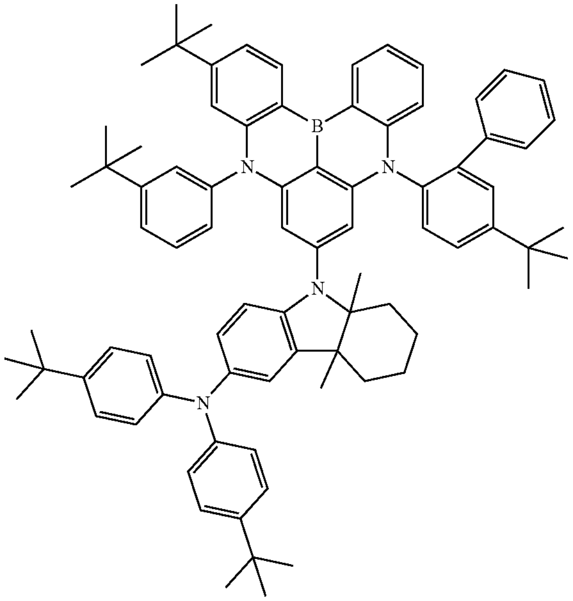
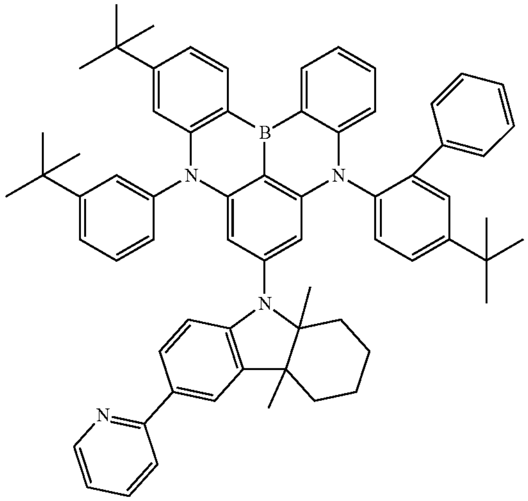
-continued
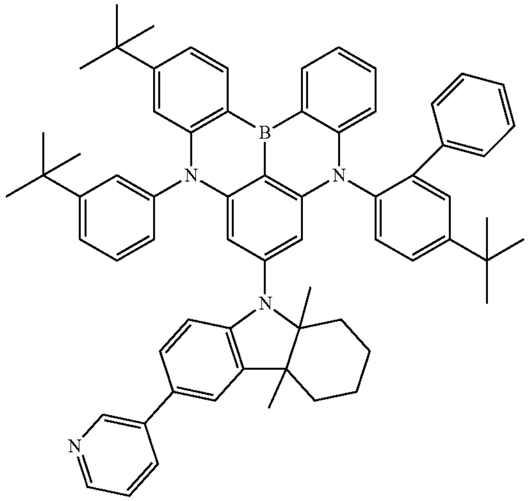
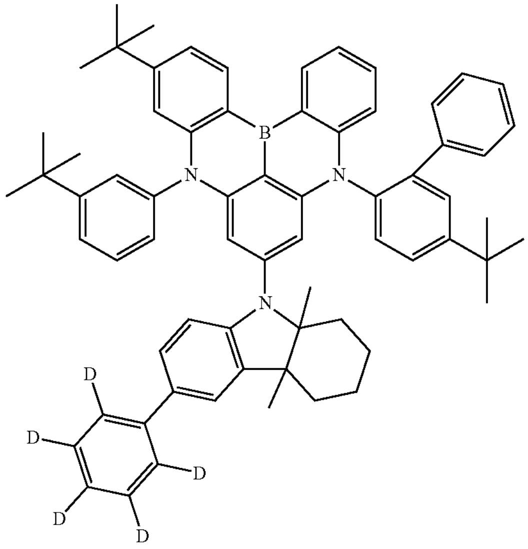
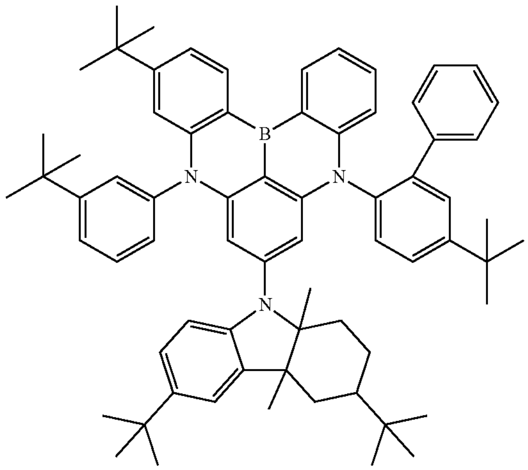

-continued
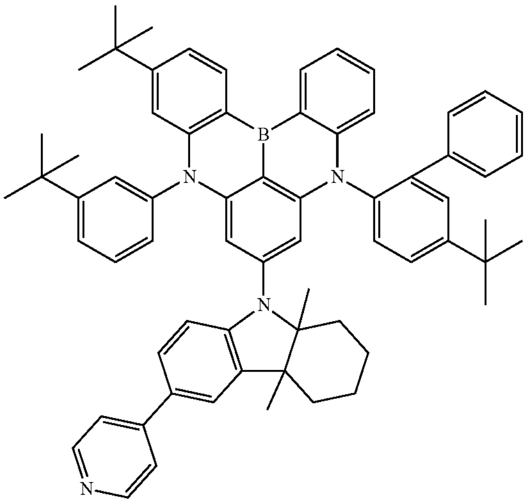
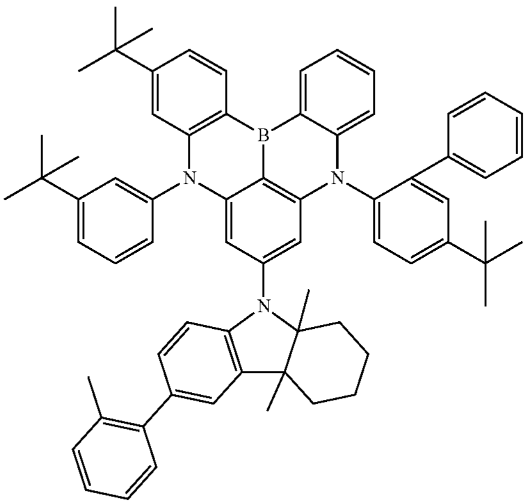
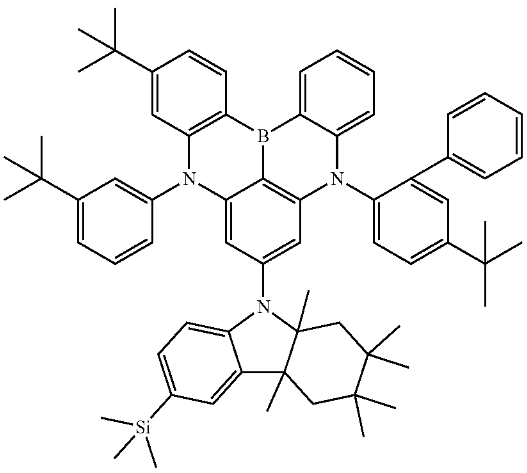
-continued
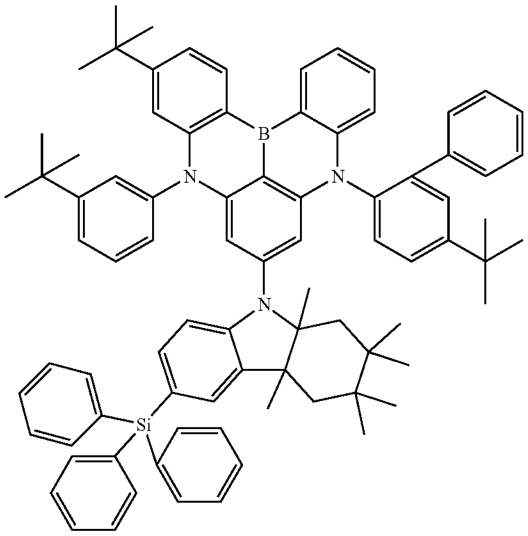
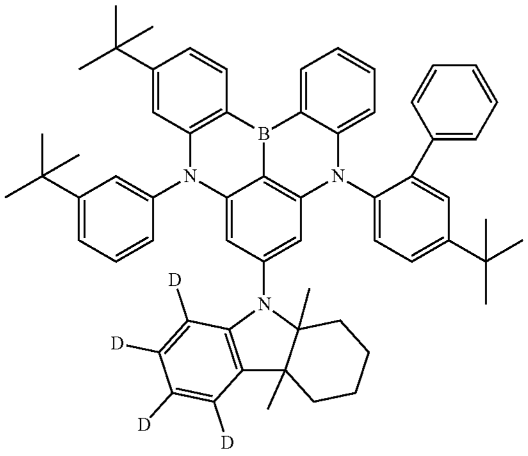
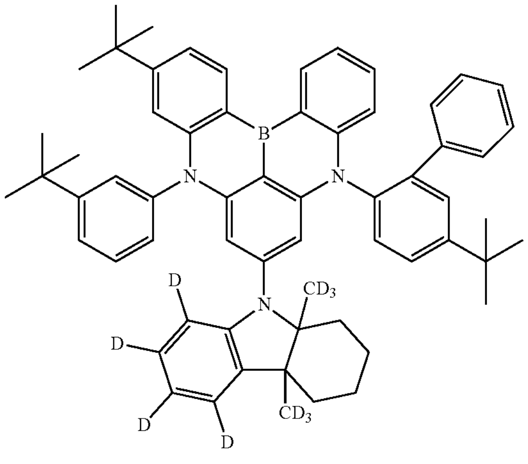

-continued
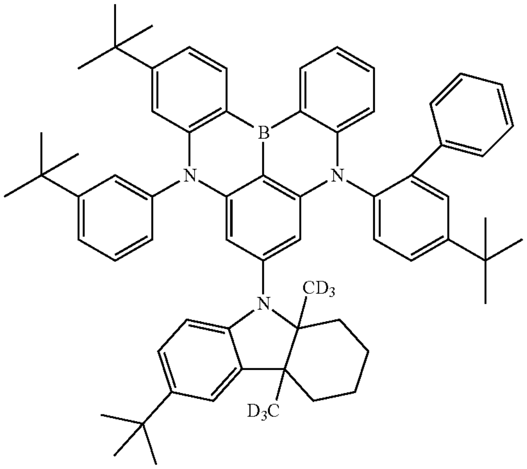
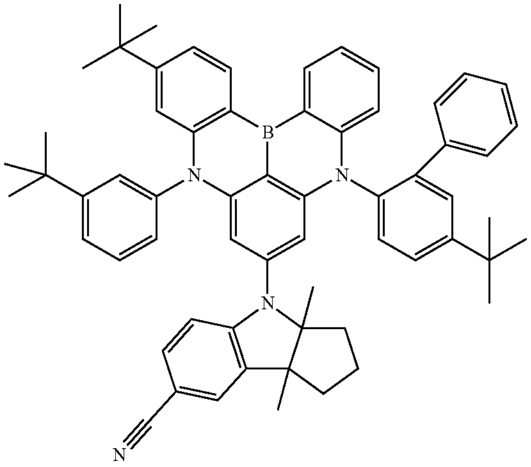
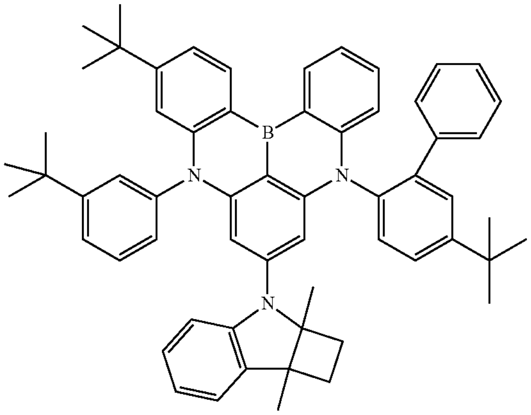
-continued
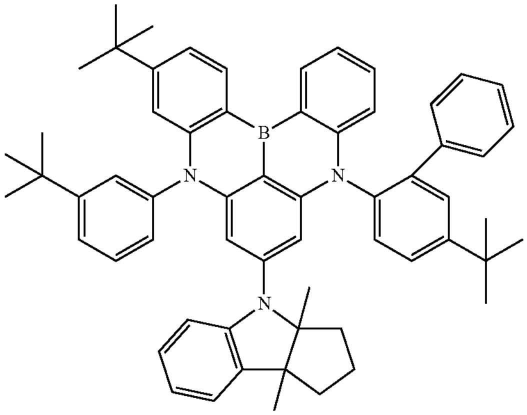
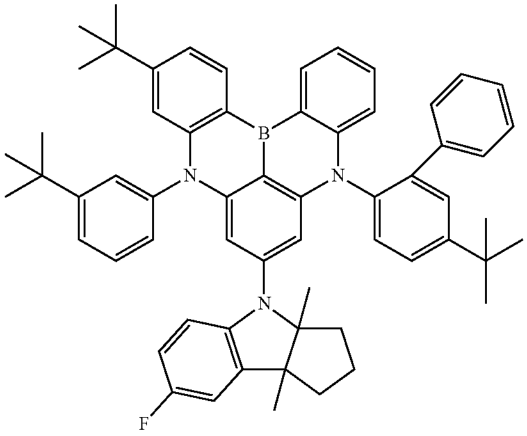
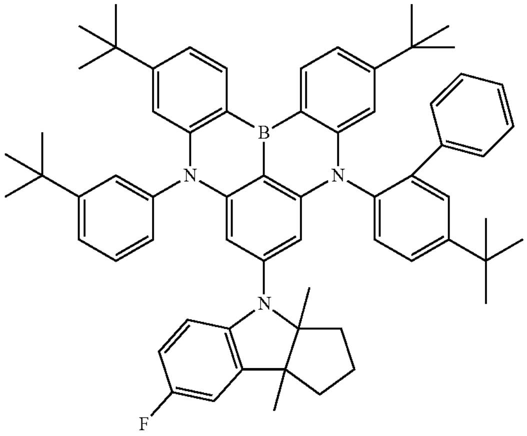
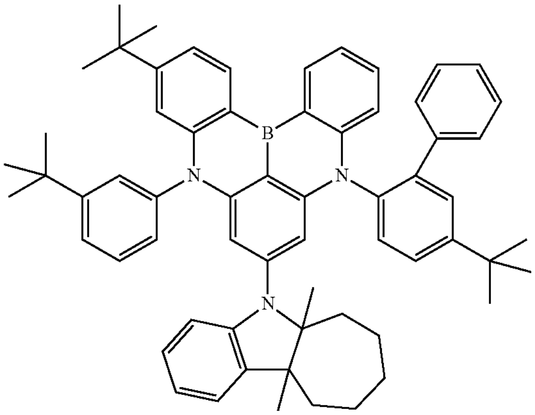

-continued
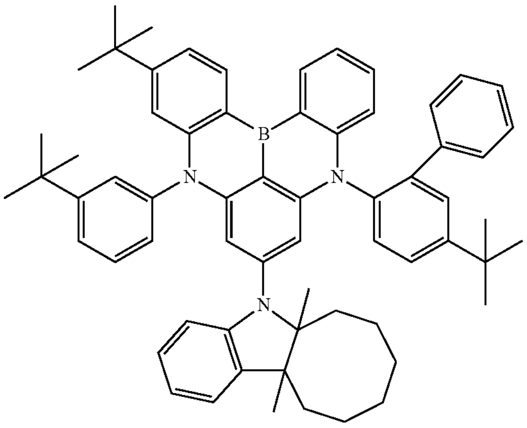
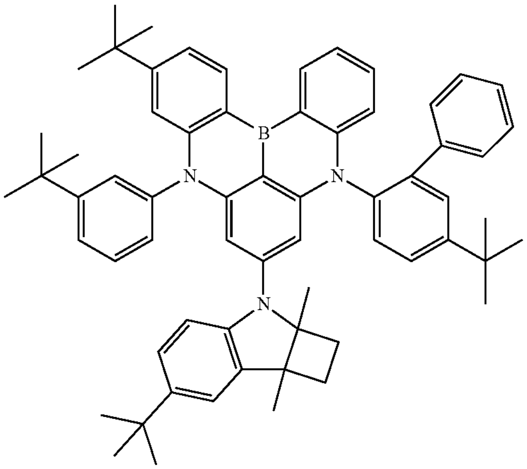
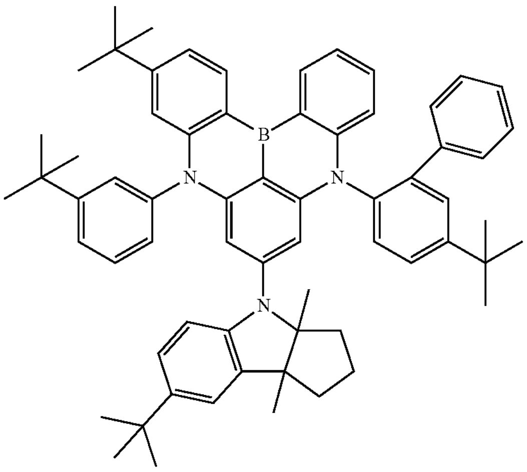
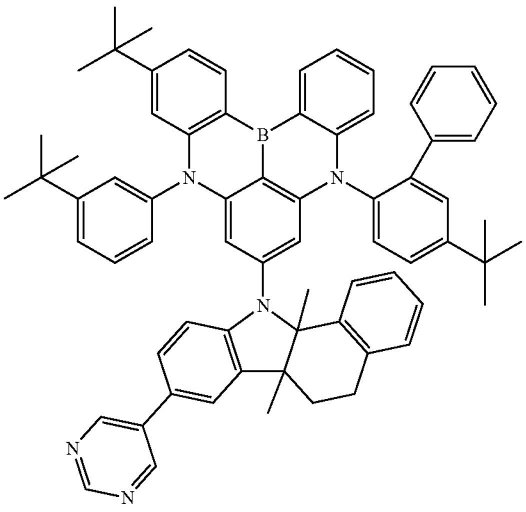
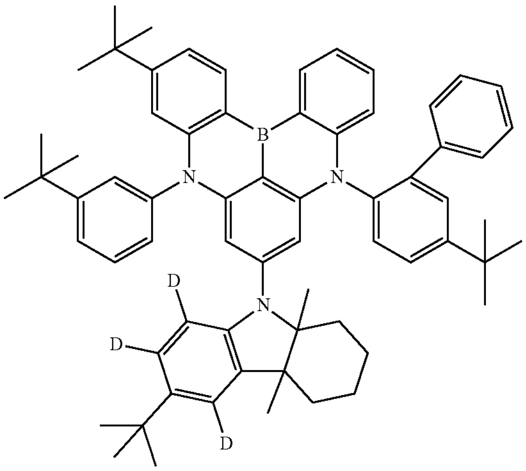
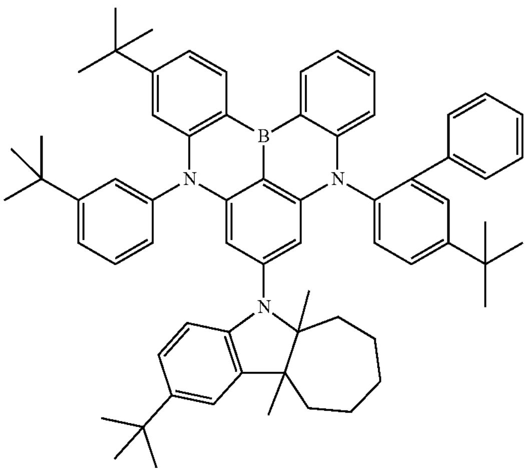

-continued
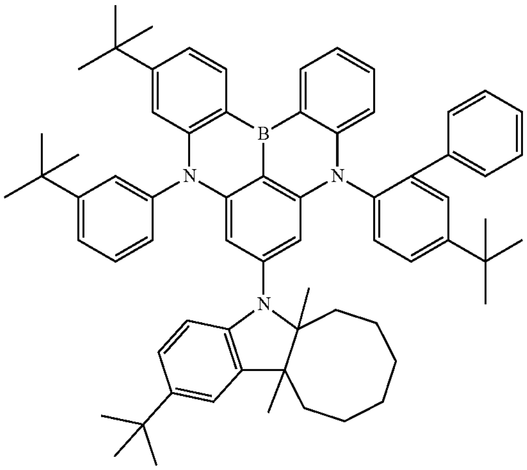
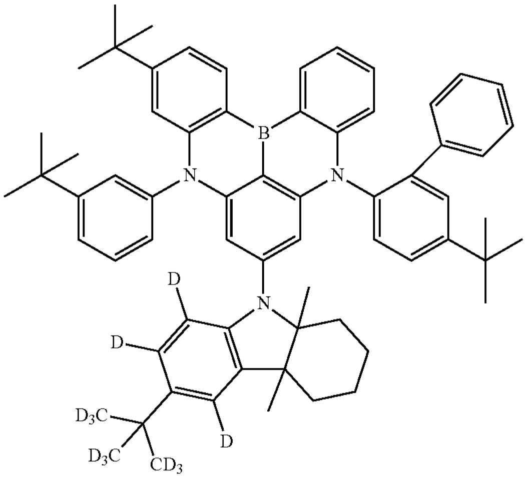
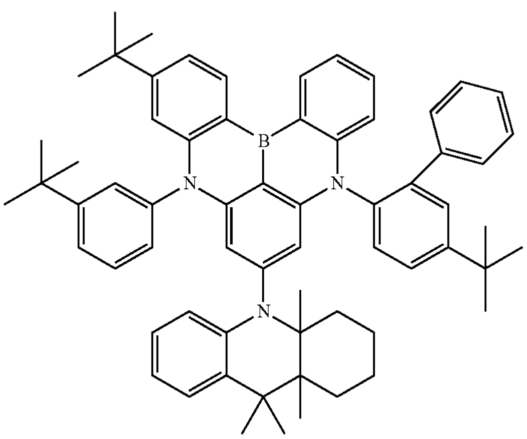
-continued
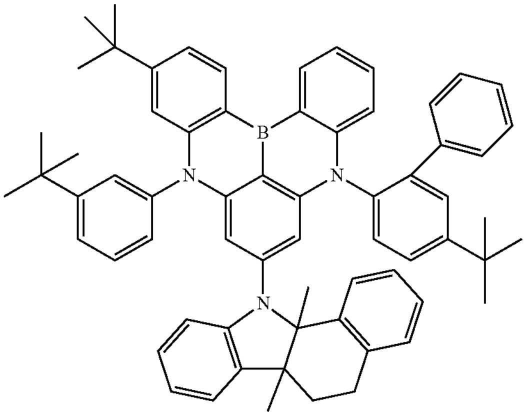
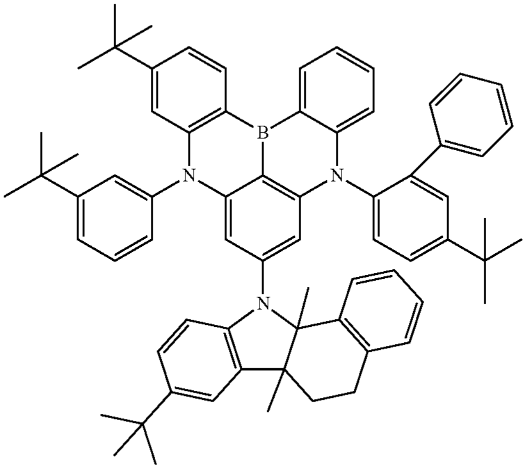
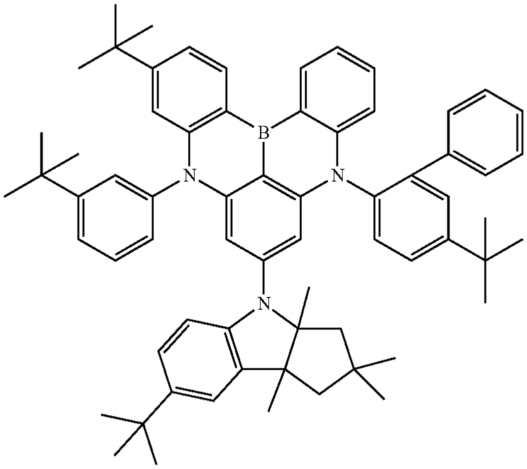

-continued
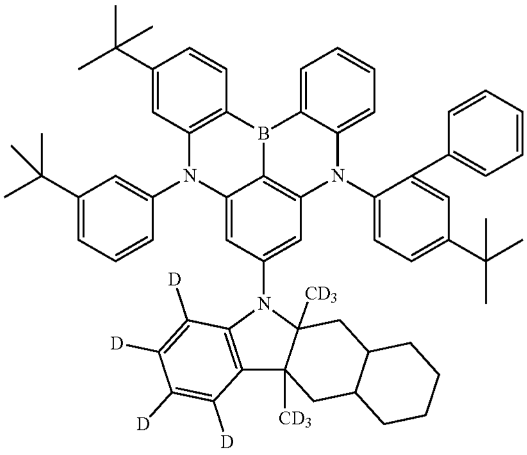
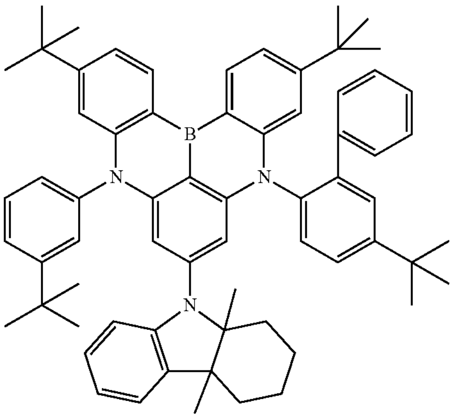
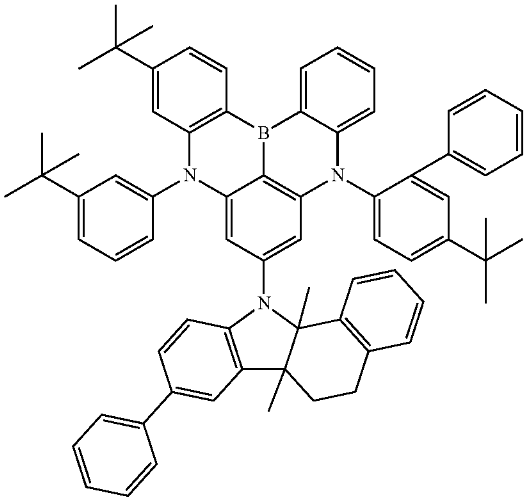
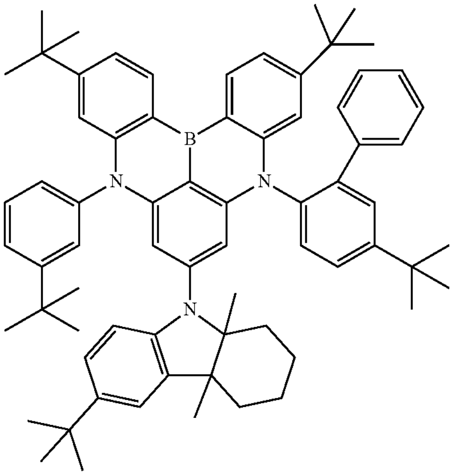
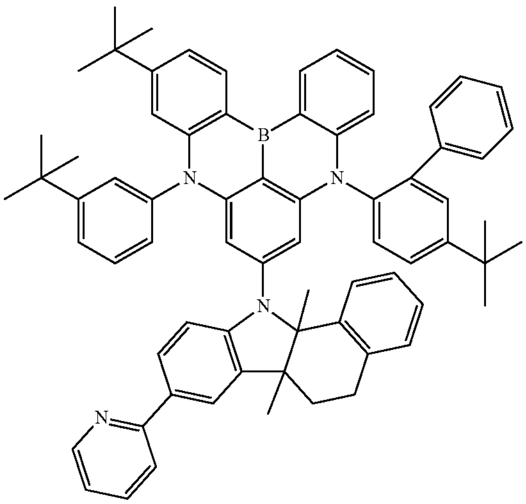
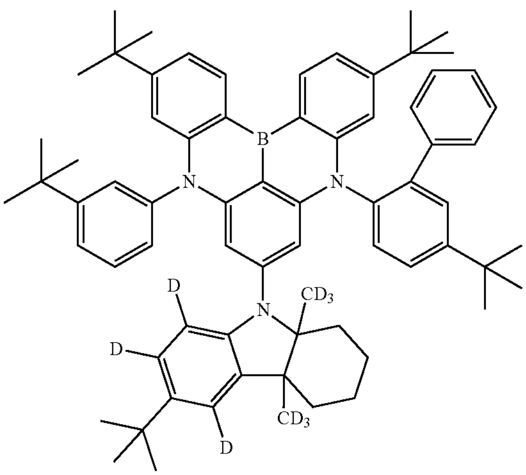

-continued
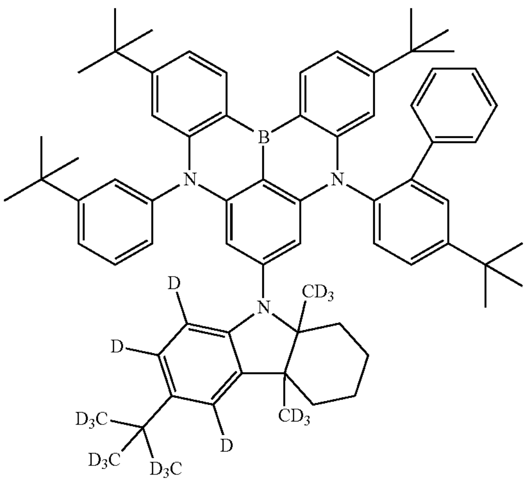
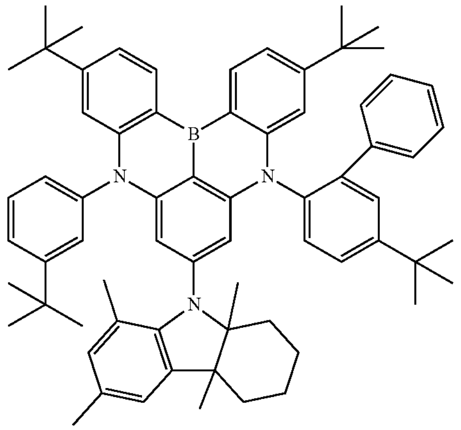
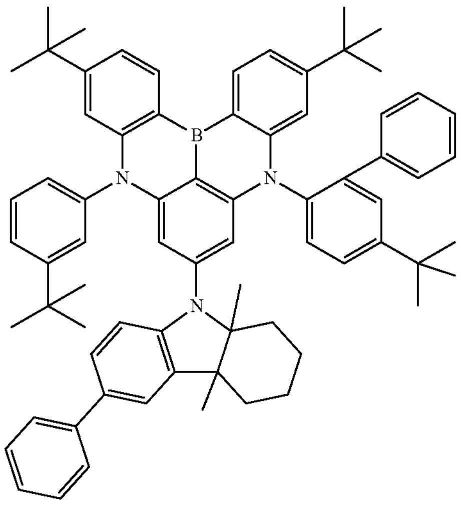
-continued
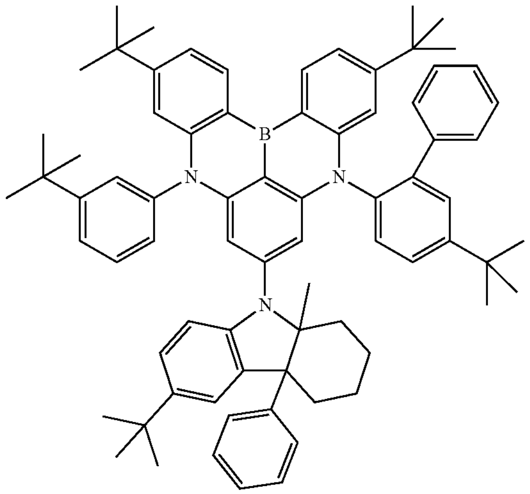
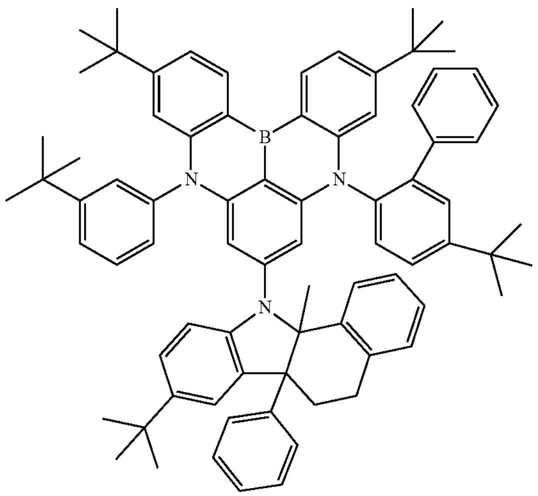
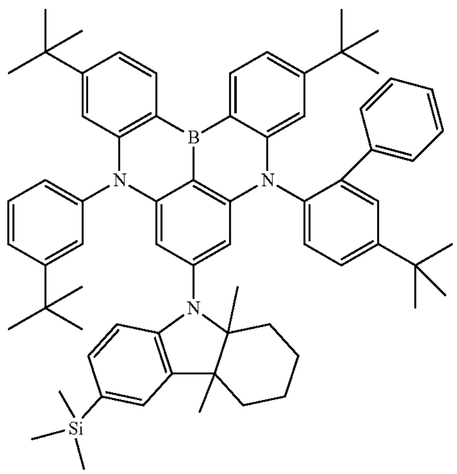

-continued
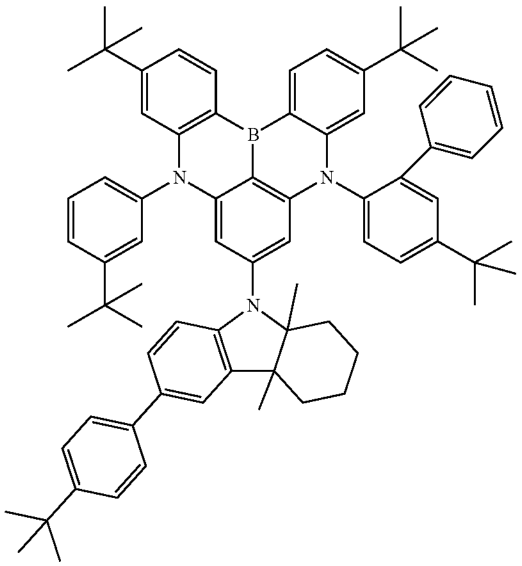
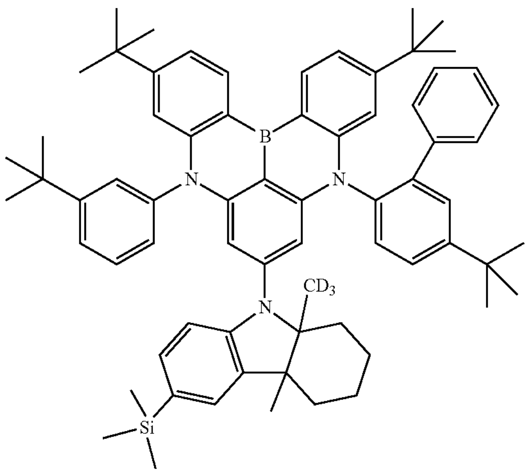
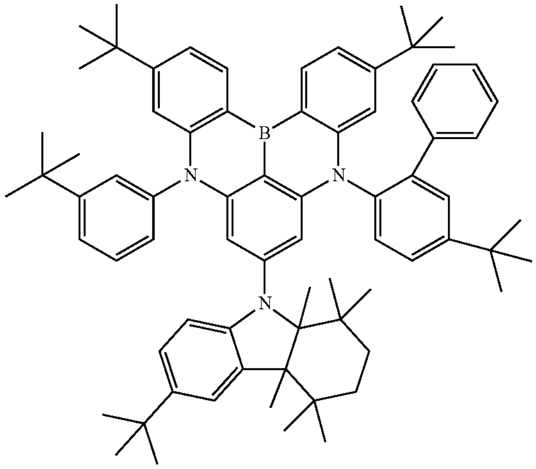
-continued
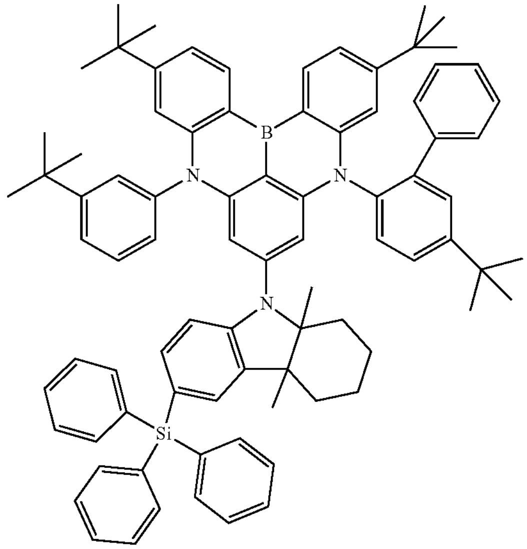
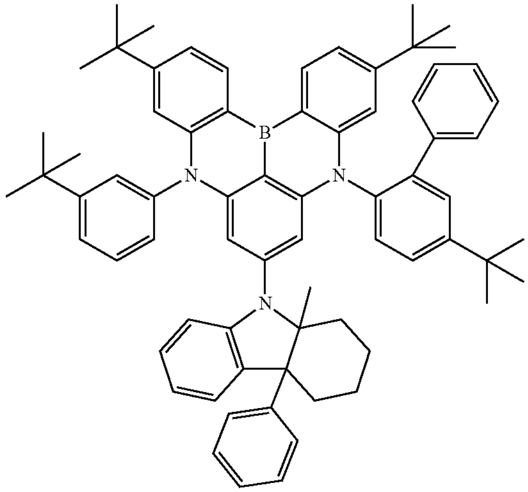
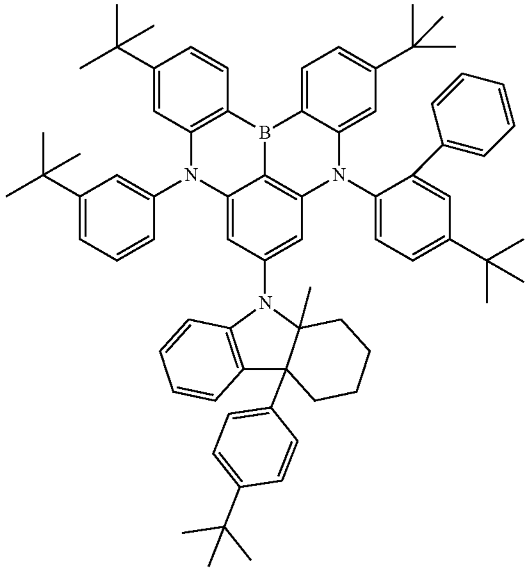

-continued
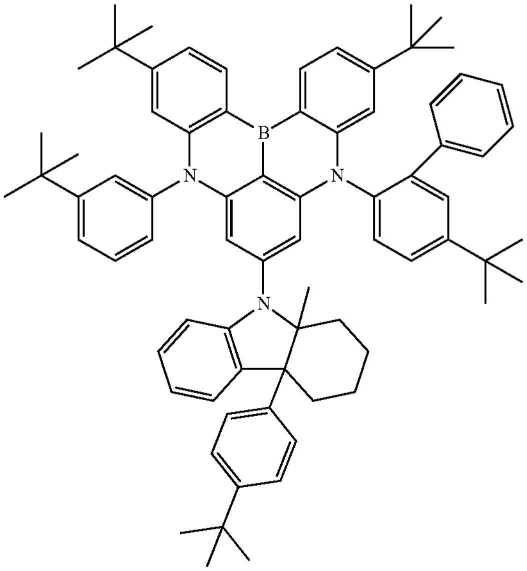
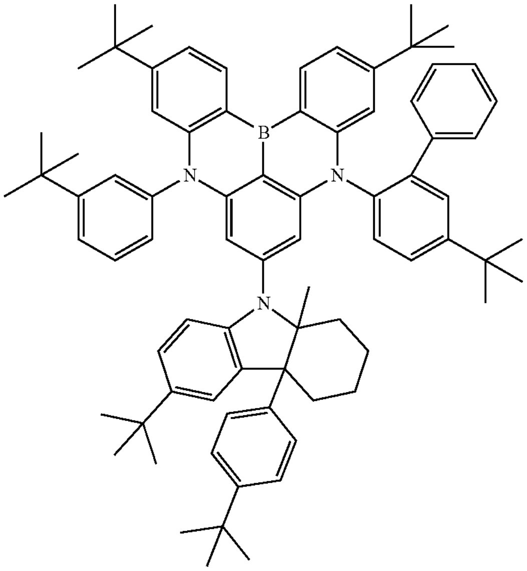
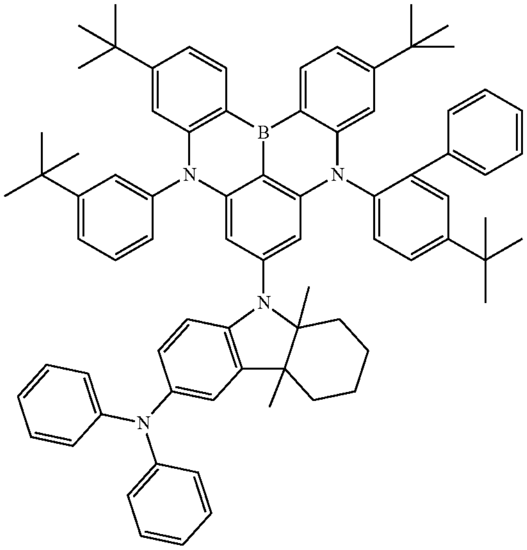
-continued
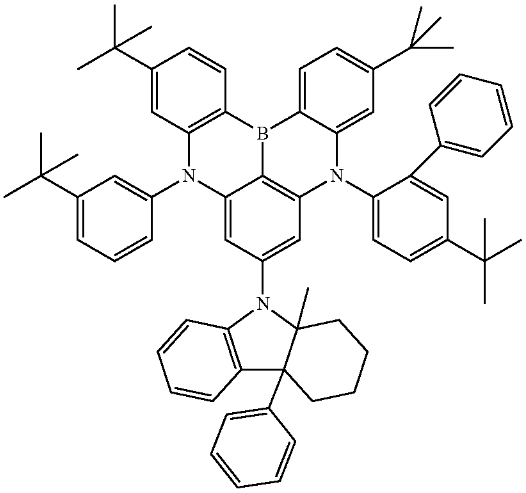
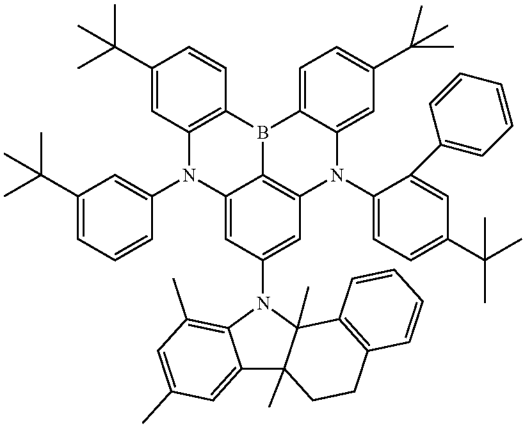
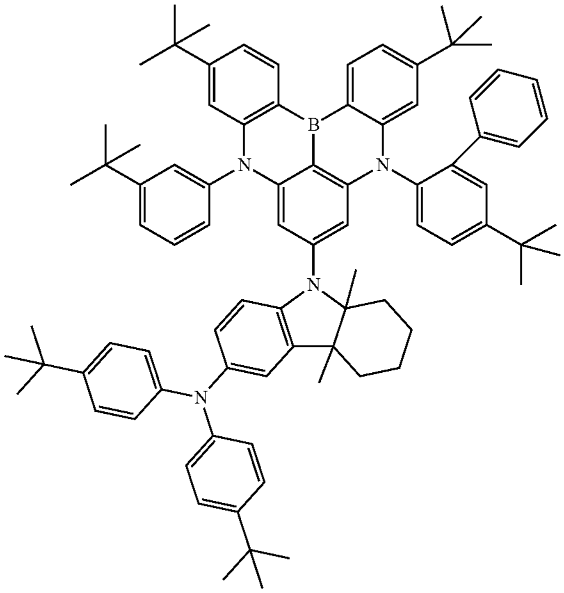

-continued
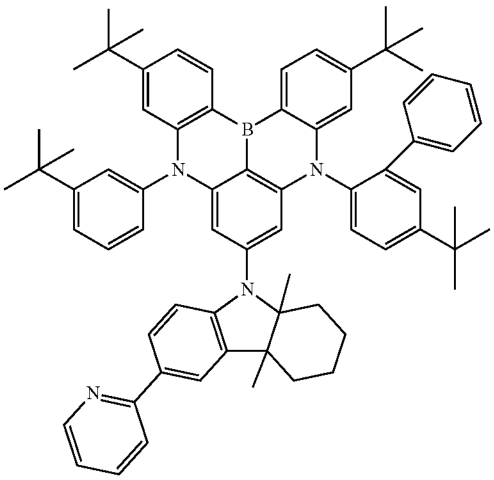
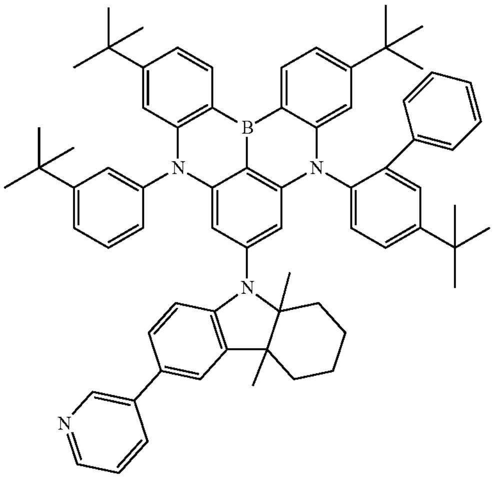
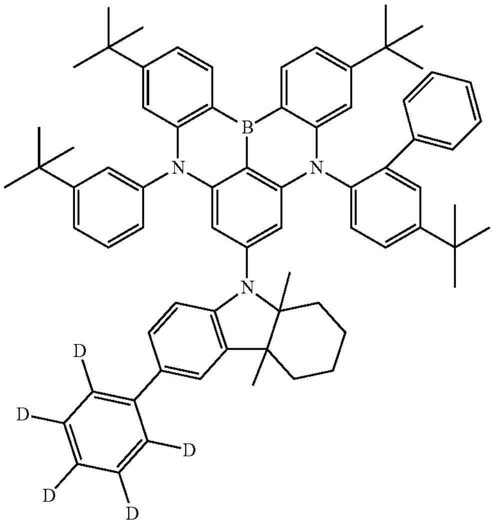
-continued
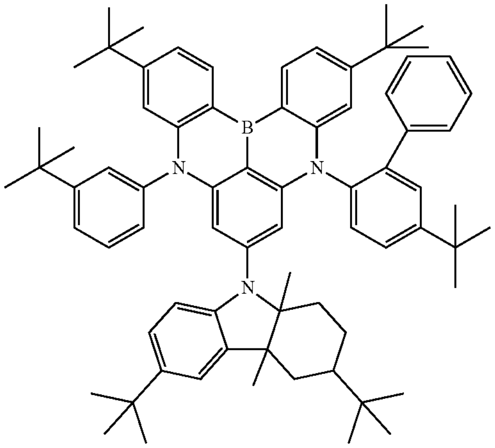
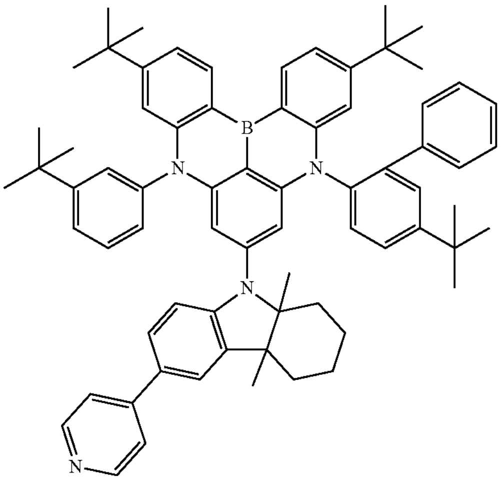
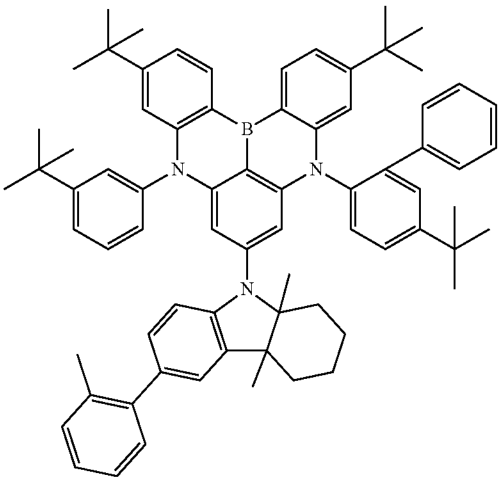

-continued
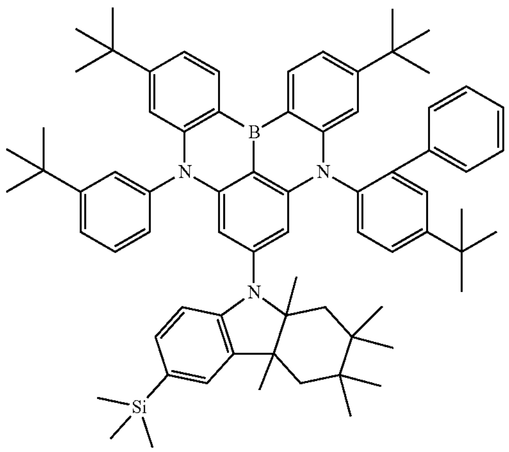
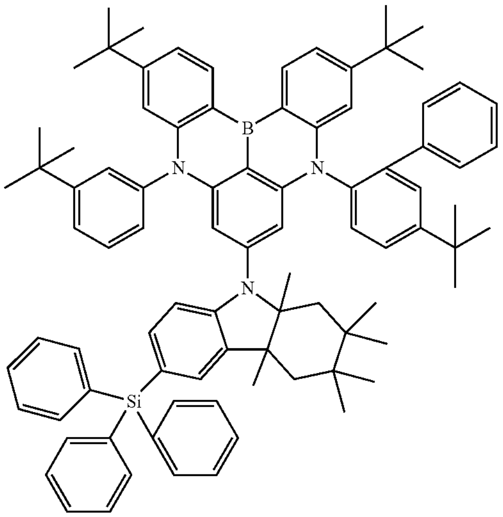
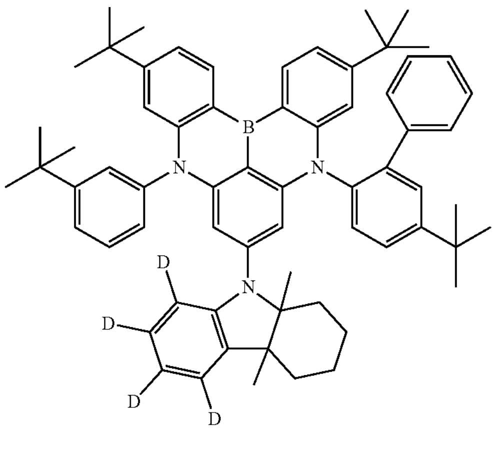
-continued
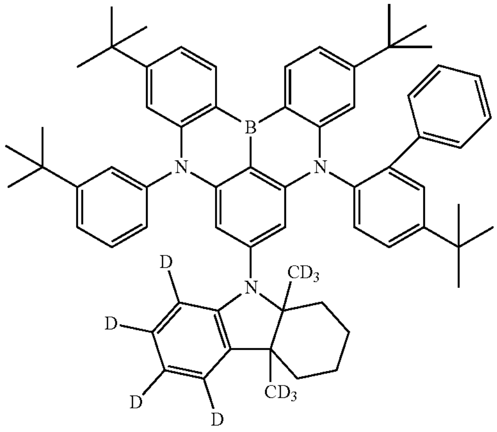
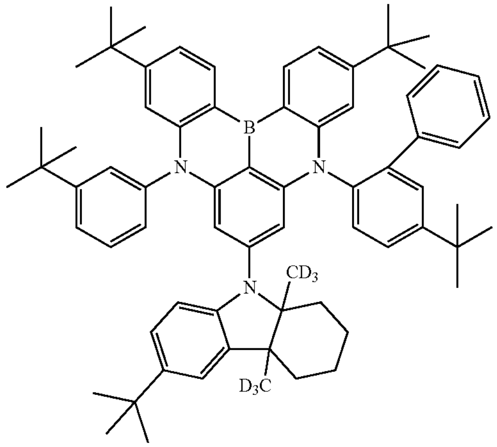
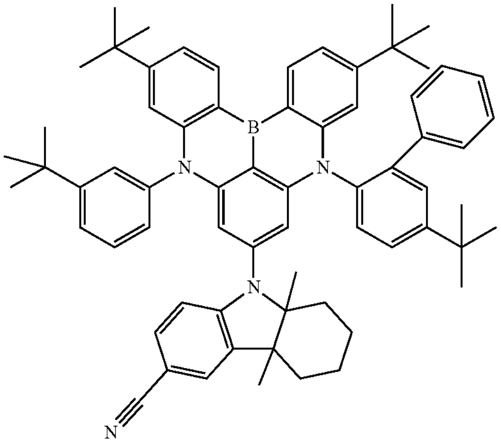
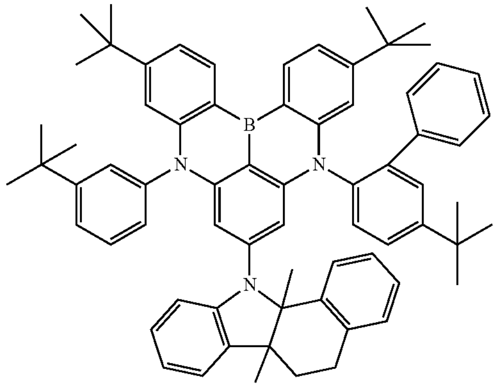

-continued
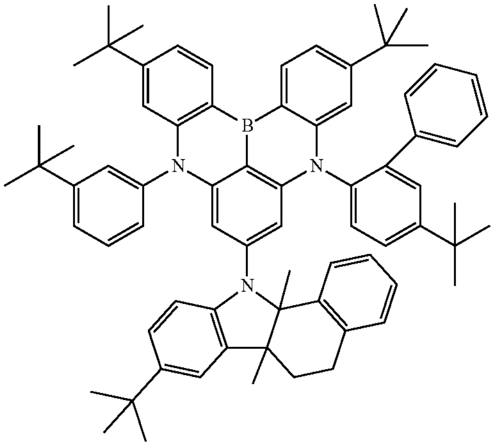
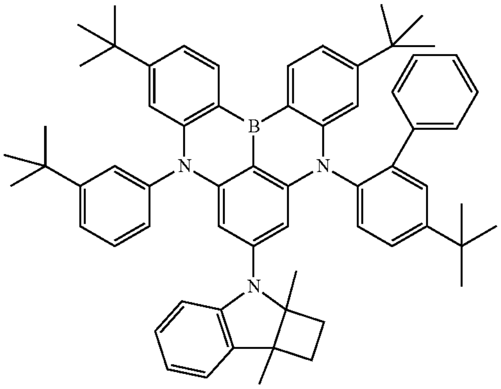
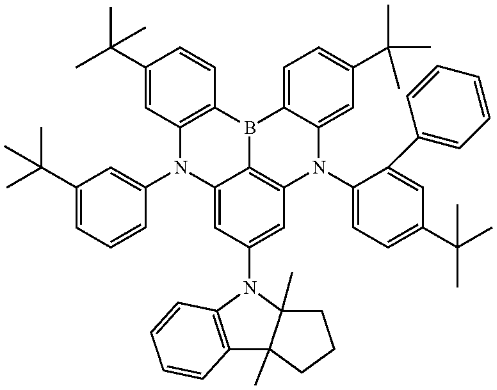
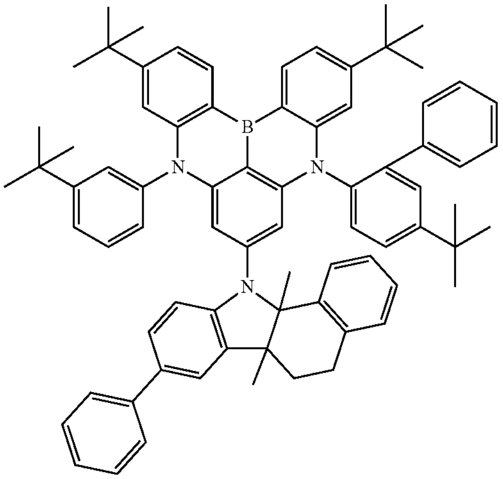
-continued
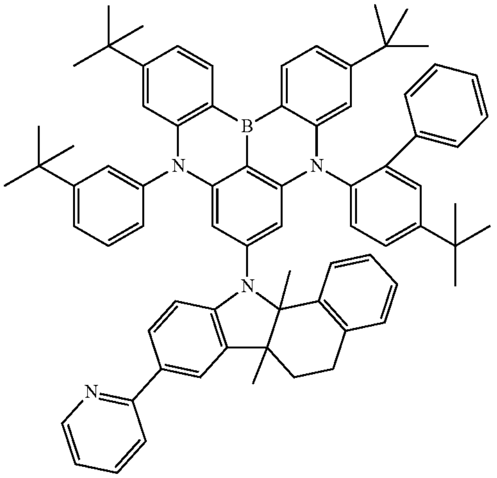
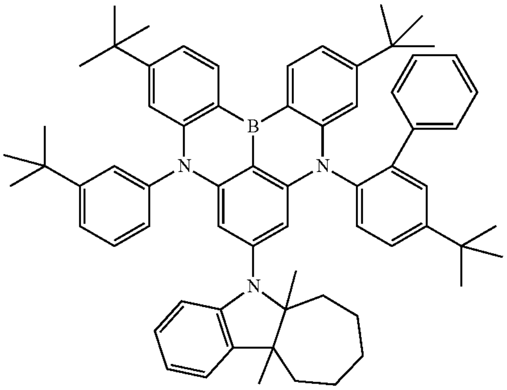
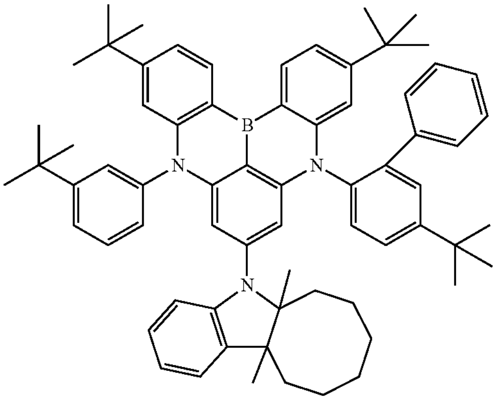

-continued
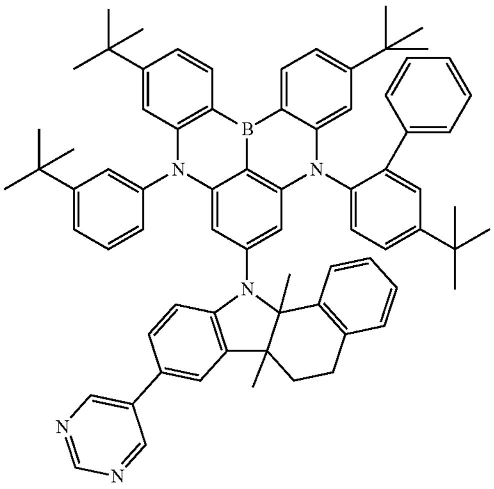
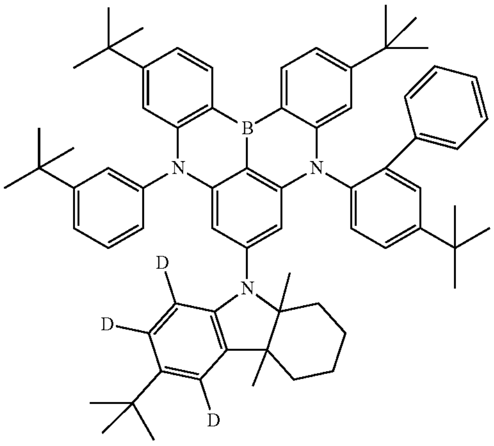
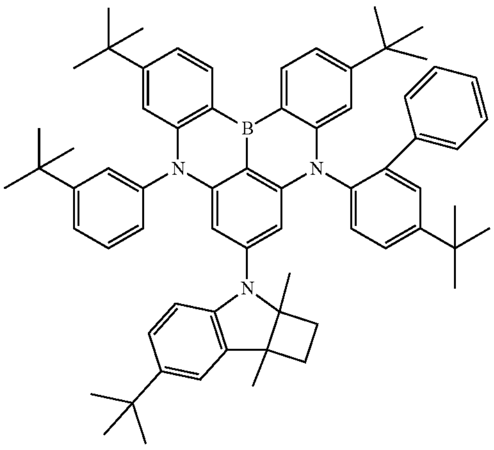
-continued
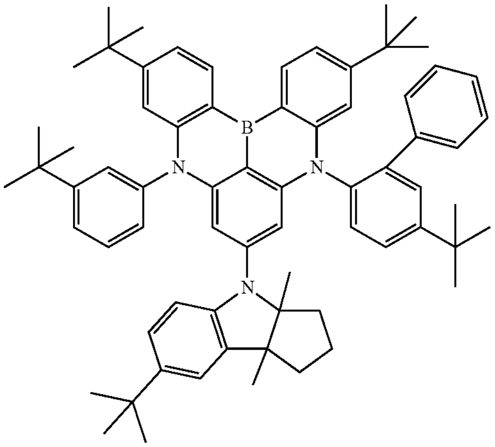
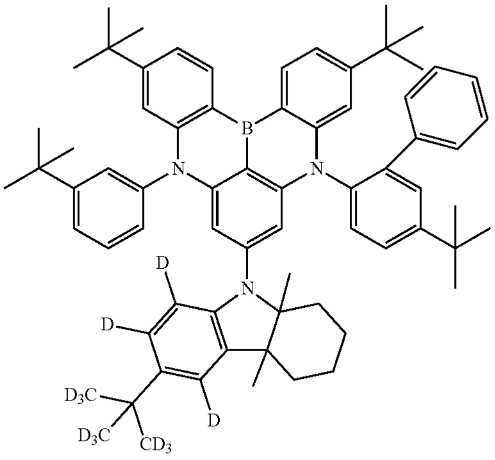
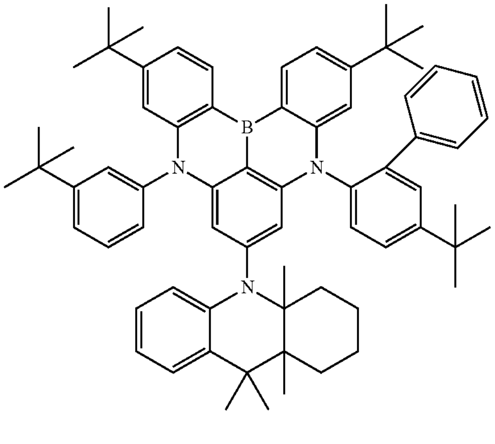

-continued
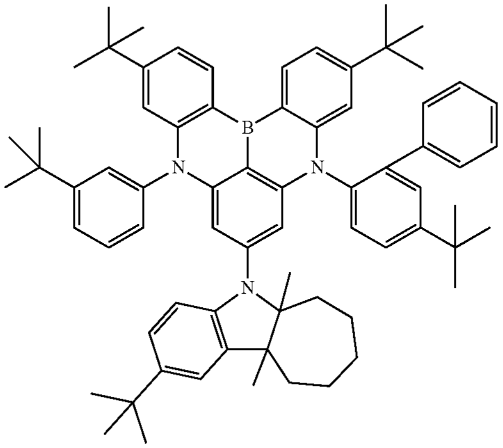
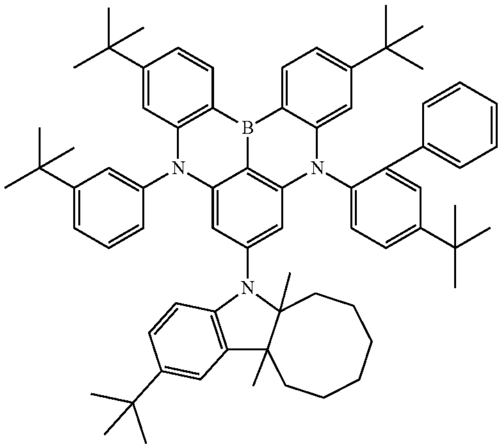
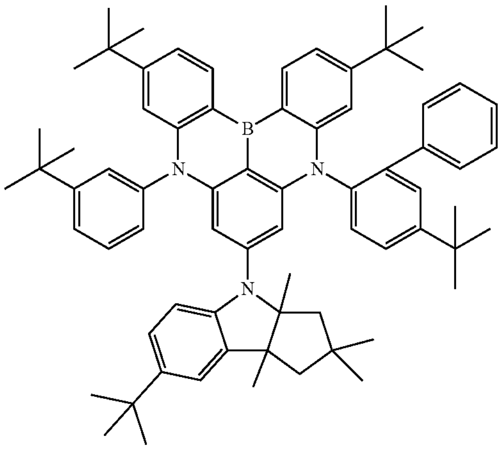
-continued
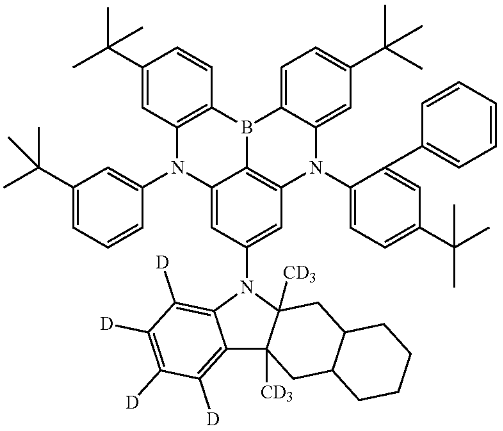
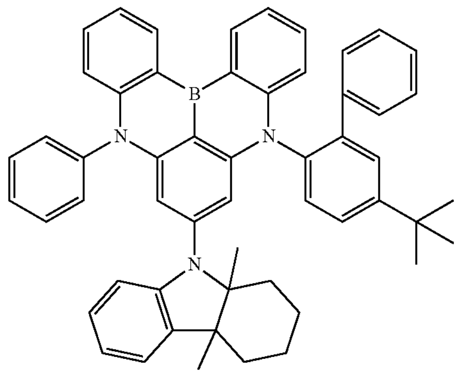
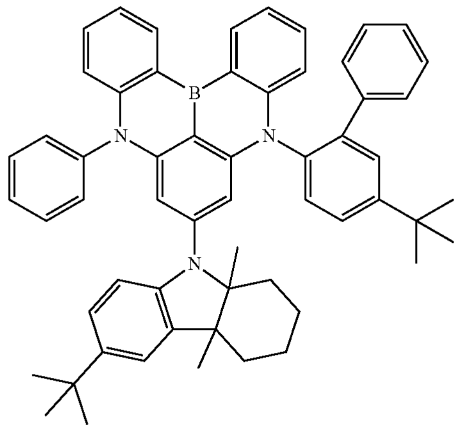

-continued
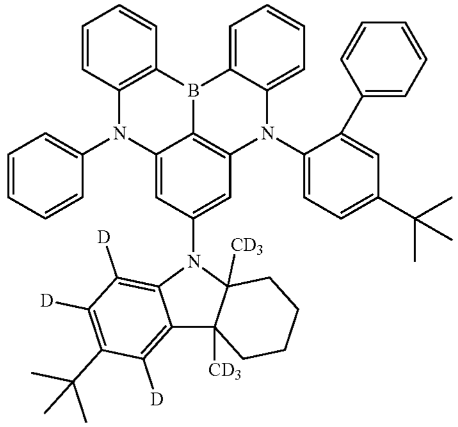
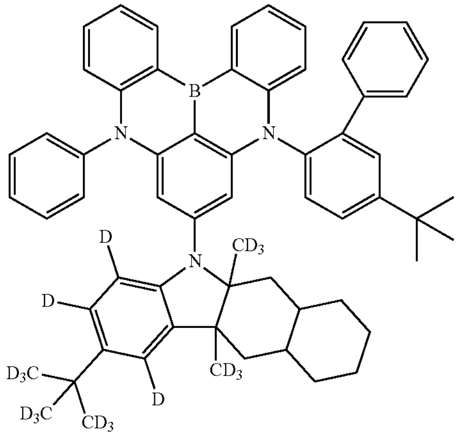 [SMILES: [2H]c1c([2H])c(C(C([2H])([2H])[2H])(C([2H])([2H])[2H])C([2H])([2H])[2H])c([2H])c2c1N(c1cc3c4c(c1)N(c1ccc(C(C)(C)C)cc1-c1ccccc1)c1ccccc1B4c1ccccc1N3c1ccccc1)C1(C([2H])([2H])[2H])CC3CCCCC3CC21C([2H])([2H])[2H]]
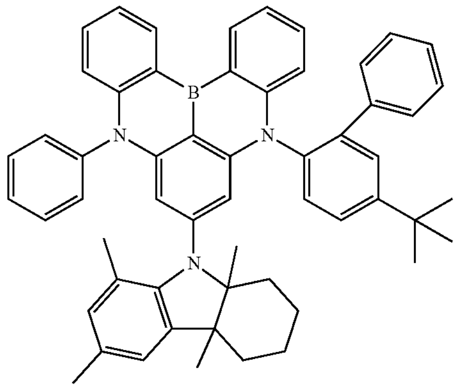
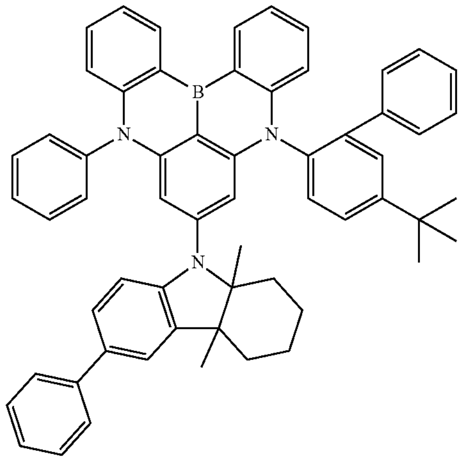
-continued
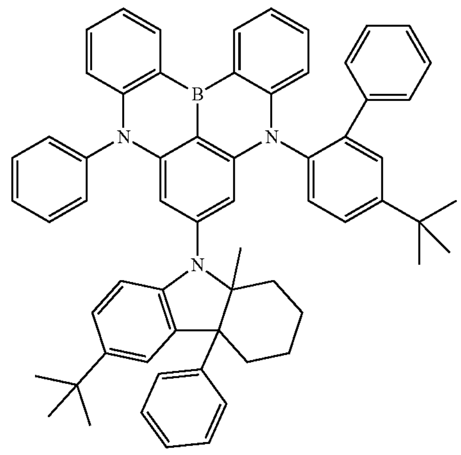
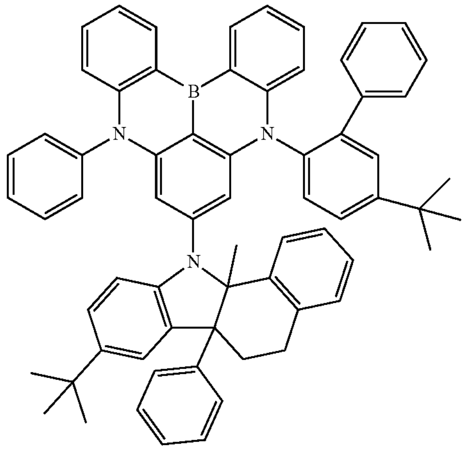 [SMILES: CC(C)(C)c1ccc(N2c3ccccc3B3c4ccccc4N(c4ccccc4)c4cc(N5c6ccc(C(C)(C)C)cc6C6(c7ccccc7)CCc7ccccc7C56C)cc2c43)c(-c2ccccc2)c1]
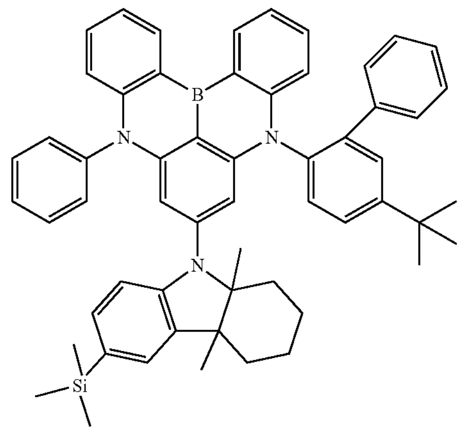

-continued
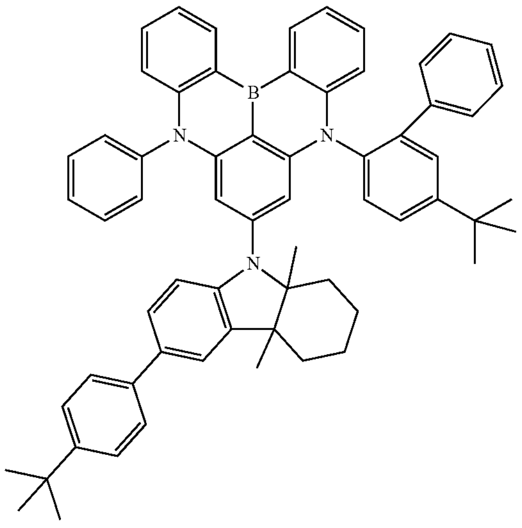
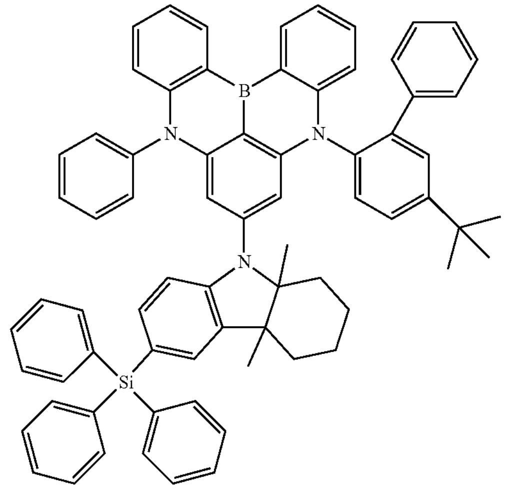
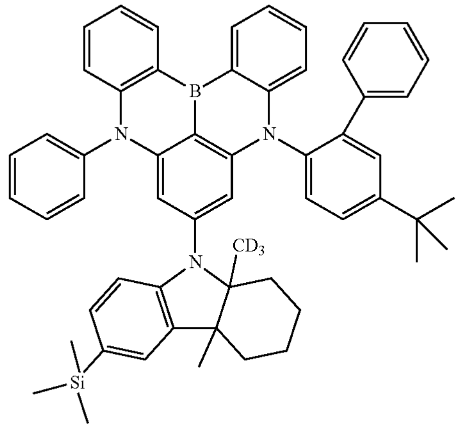
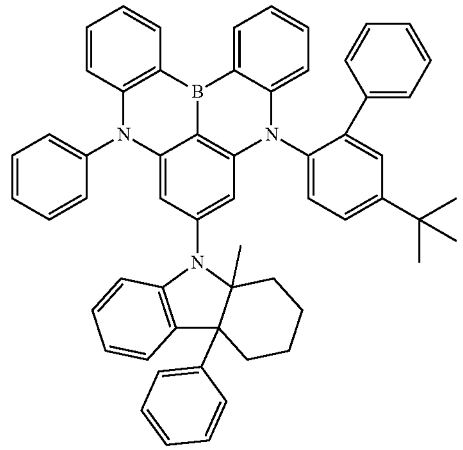
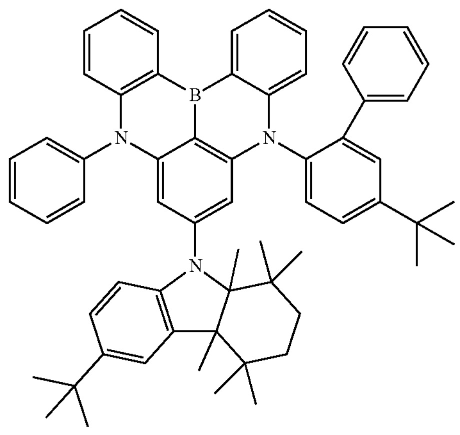 [SMILES: CC(C)(C)c1ccc(N2c3ccccc3B3c4ccccc4N(c4ccccc4)c4cc(N5c6ccc(C(C)(C)C)cc6C6(C)C(C)(C)CCC(C)(C)C56C)cc2c43)c(-c2ccccc2)c1]
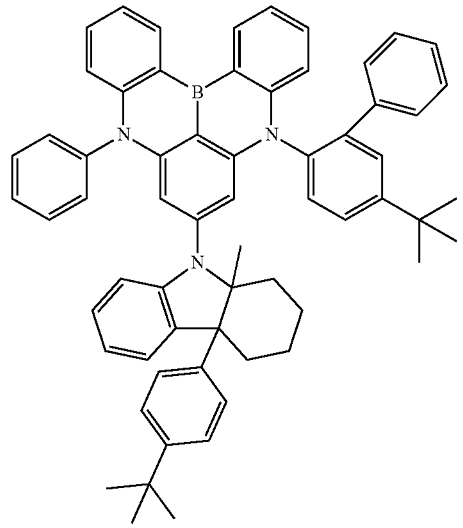
-continued -continued
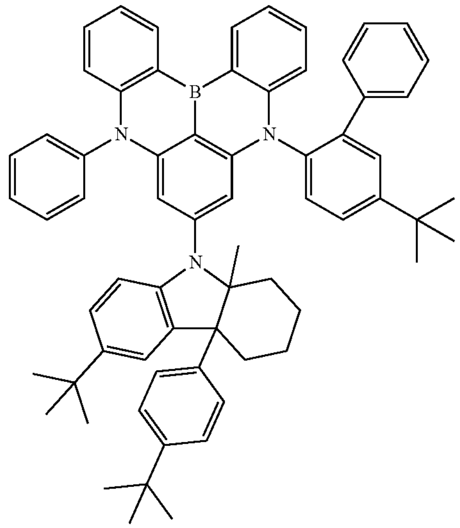 [SMILES: CC(C)(C)c1ccc(C23CCCCC2(C)N(c2cc4c5c(c2)N(c2ccc(C(C)(C)C)cc2-c2ccccc2)c2ccccc2B5c2ccccc2N4c2ccccc2)c2ccc(C(C)(C)C)cc23)cc1]
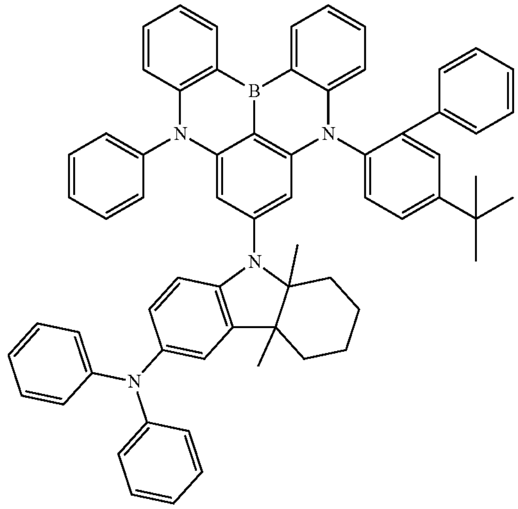
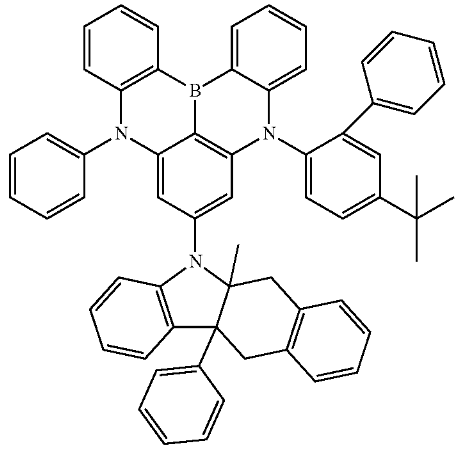
-continued
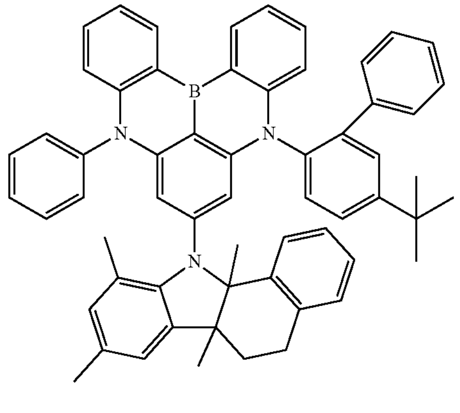
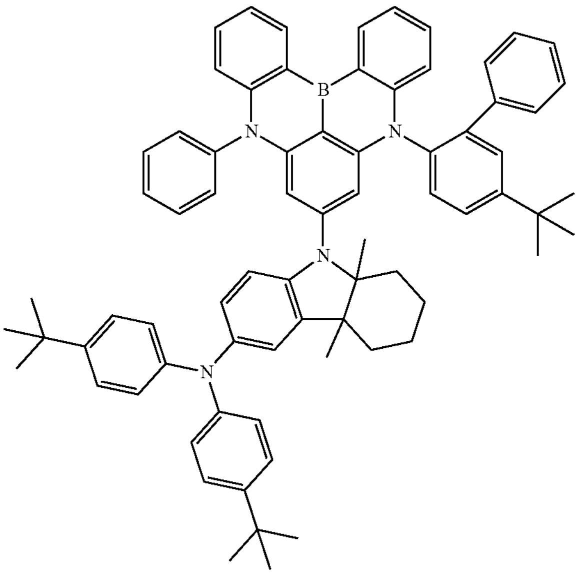 [SMILES: CC(C)(C)c1ccc(N(c2ccc(C(C)(C)C)cc2)c2ccc3c(c2)C2(C)CCCCC2(C)N3c2cc3c4c(c2)N(c2ccc(C(C)(C)C)cc2-c2ccccc2)c2ccccc2B4c2ccccc2N3c2ccccc2)cc1]
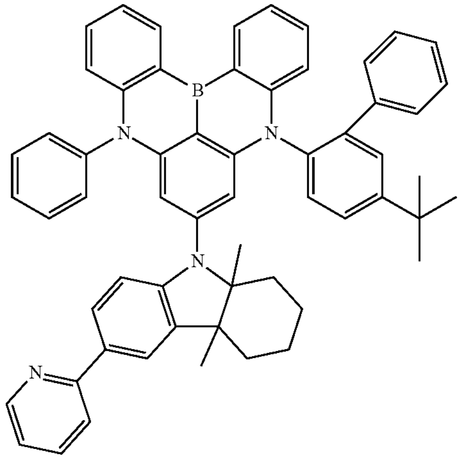

-continued
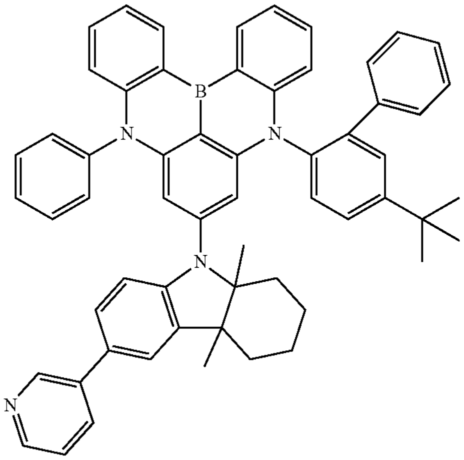
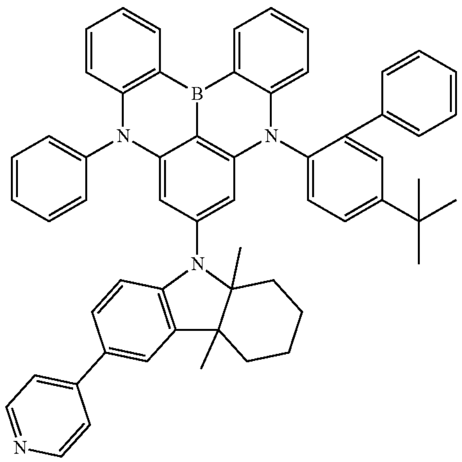
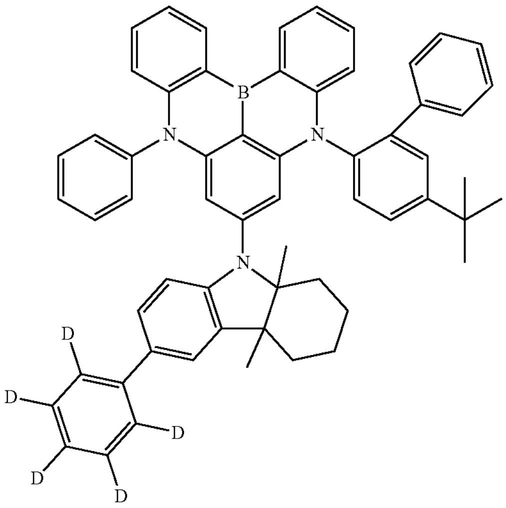
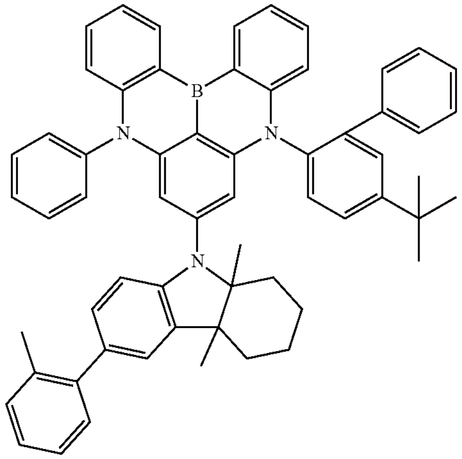
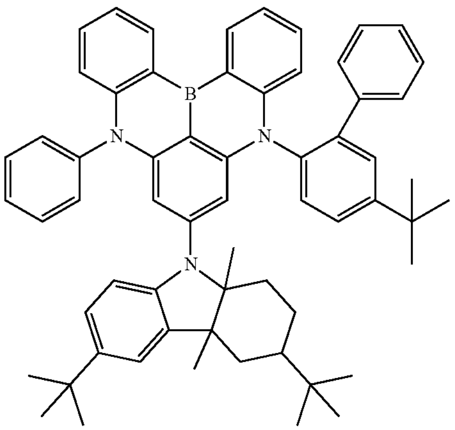 [SMILES: CC(C)(C)c1ccc(N2c3ccccc3B3c4ccccc4N(c4ccccc4)c4cc(N5c6ccc(C(C)(C)C)cc6C6(C)CC(C(C)(C)C)CCC56C)cc2c43)c(-c2ccccc2)c1]
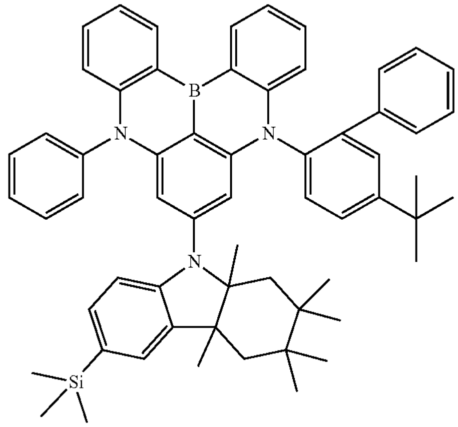
-continued -continued
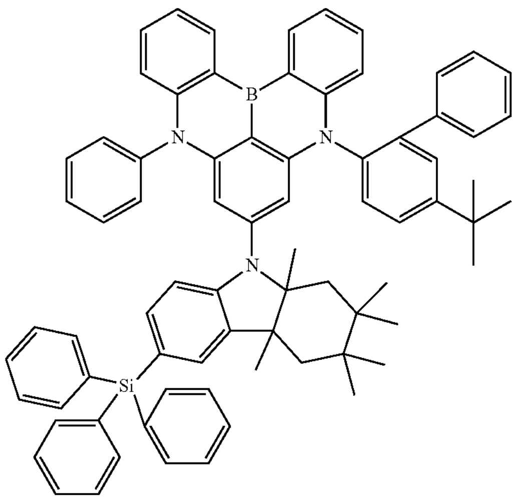 [SMILES: CC(C)(C)c1ccc(N2c3ccccc3B3c4ccccc4N(c4ccccc4)c4cc(N5c6ccc([Si](c7ccccc7)(c7ccccc7)c7ccccc7)cc6C6(C)CC(C)(C)C(C)(C)CC56C)cc2c43)c(-c2ccccc2)c1]
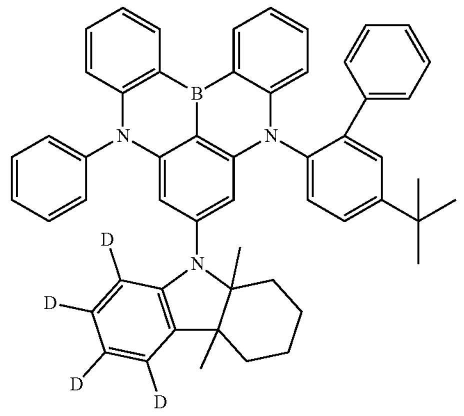
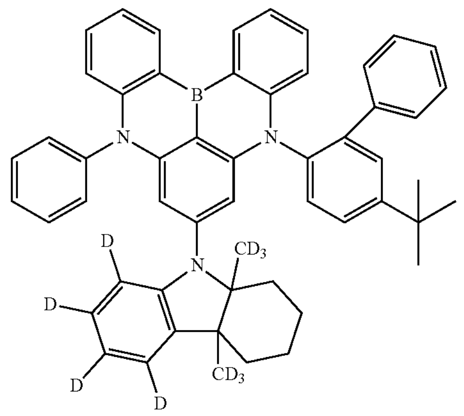
-continued
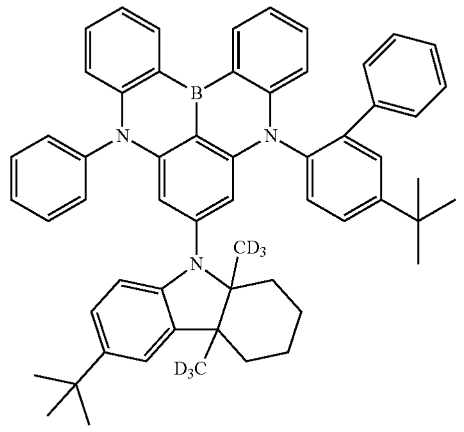
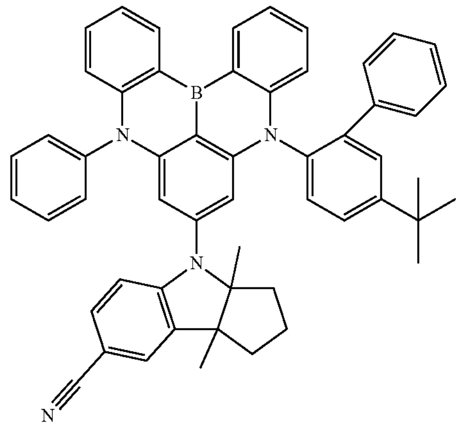 [SMILES: CC(C)(C)c1ccc(N2c3ccccc3B3c4ccccc4N(c4ccccc4)c4cc(N5c6ccc(C#N)cc6C6(C)CCCC56C)cc2c43)c(-c2ccccc2)c1]
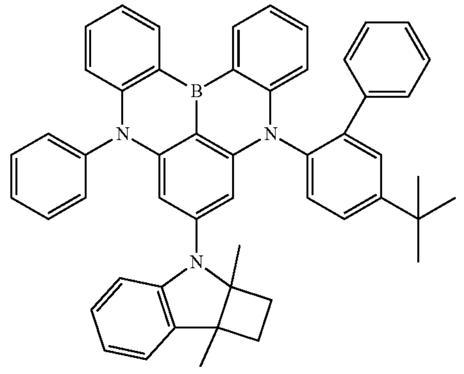
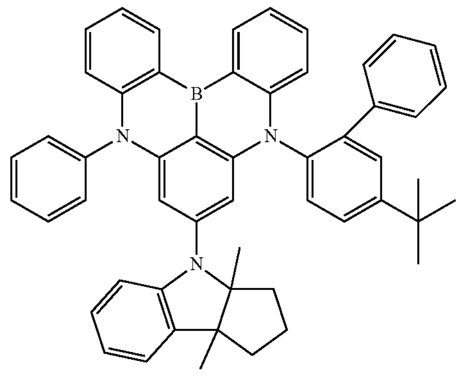

-continued
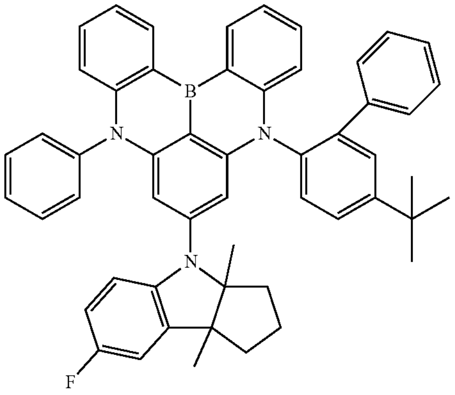
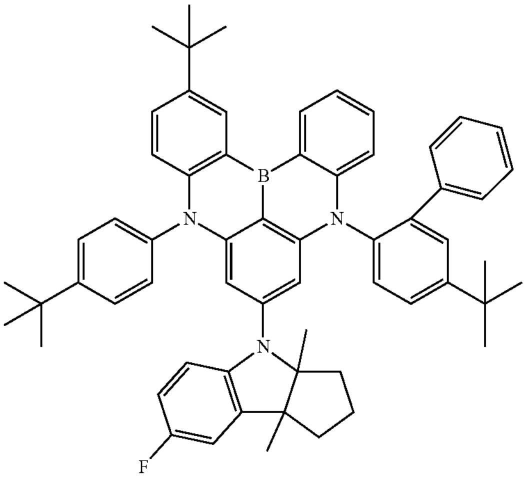 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(F)cc6C6(C)CCCC56C)cc2c43)cc1]
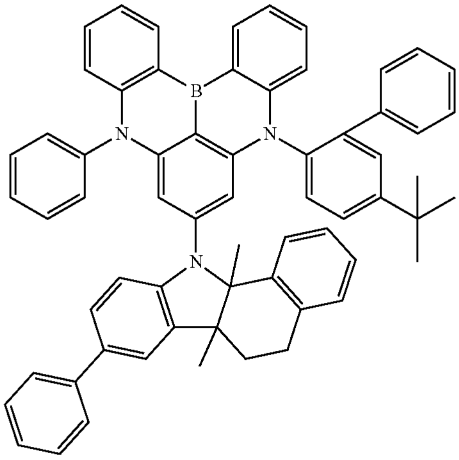
-continued
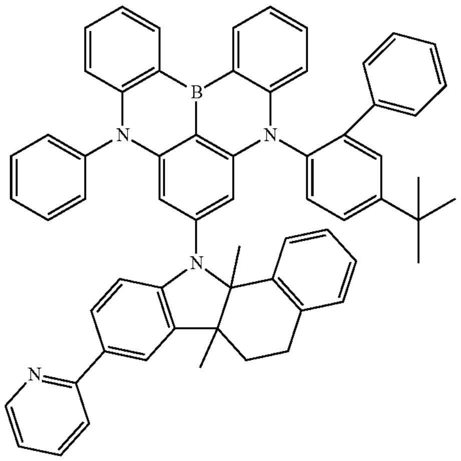
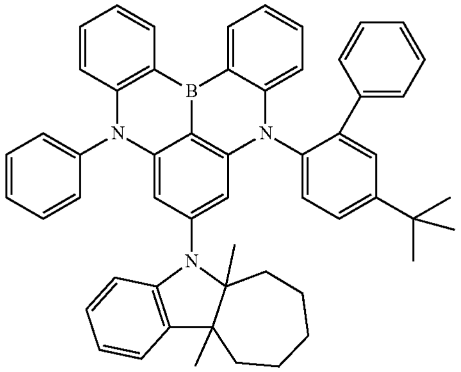
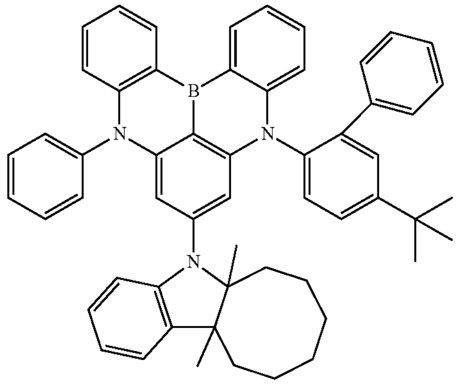 [SMILES: CC(C)(C)c1ccc(N2c3ccccc3B3c4ccccc4N(c4ccccc4)c4cc(N5c6ccccc6C6(C)CCCCCCC56C)cc2c43)c(-c2ccccc2)c1]
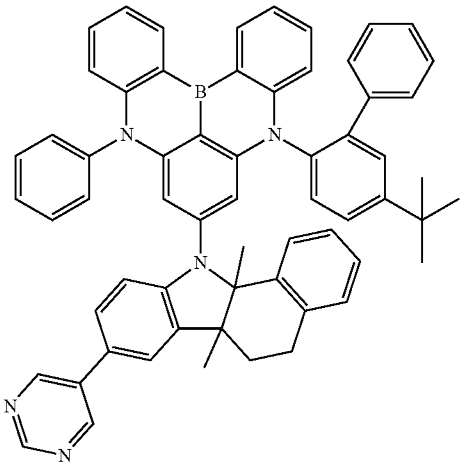

-continued
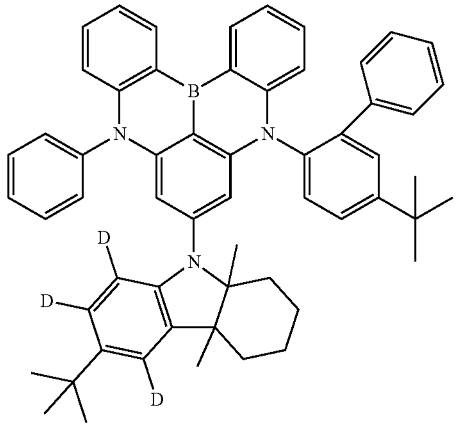
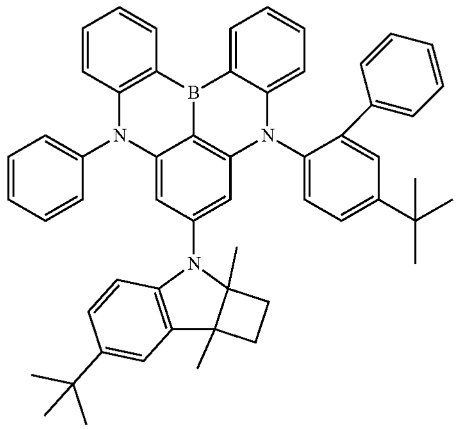
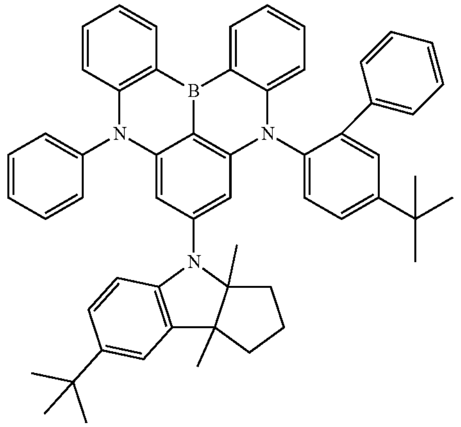 [SMILES: CC(C)(C)c1ccc(N2c3ccccc3B3c4ccccc4N(c4ccccc4)c4cc(N5c6ccc(C(C)(C)C)cc6C6(C)CCCC56C)cc2c43)c(-c2ccccc2)c1]
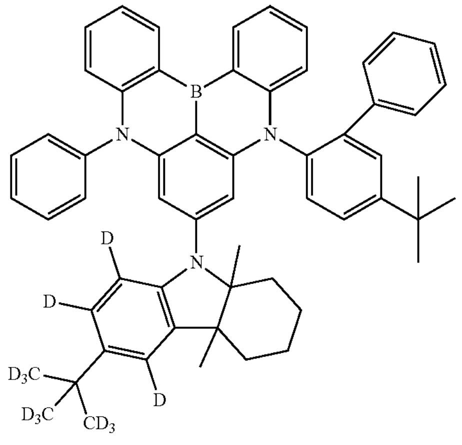
-continued
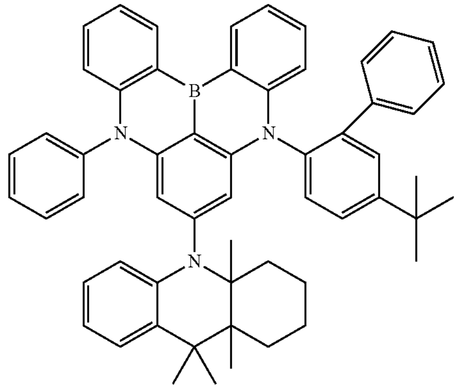
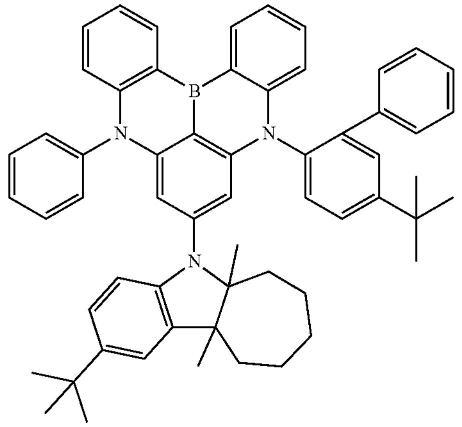
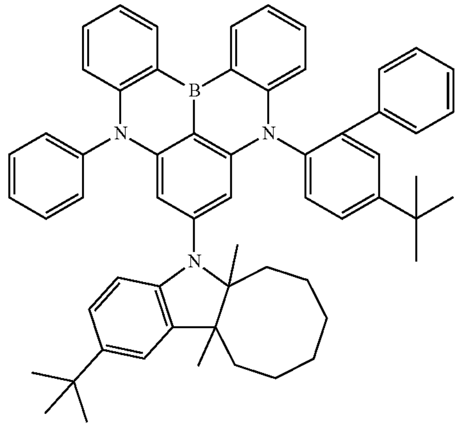 [SMILES: CC(C)(C)c1ccc(N2c3ccccc3B3c4ccccc4N(c4ccccc4)c4cc(N5c6ccc(C(C)(C)C)cc6C6(C)CCCCCCC56C)cc2c43)c(-c2ccccc2)c1]
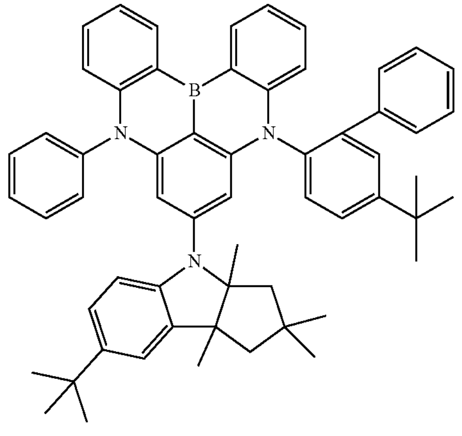

-continued
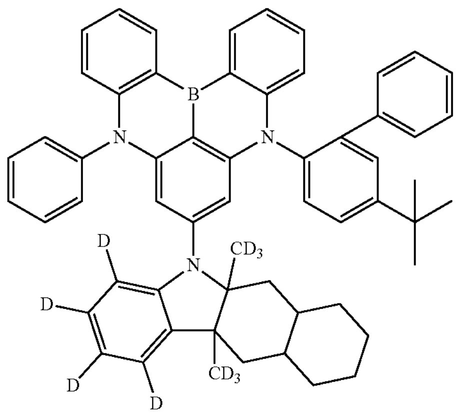
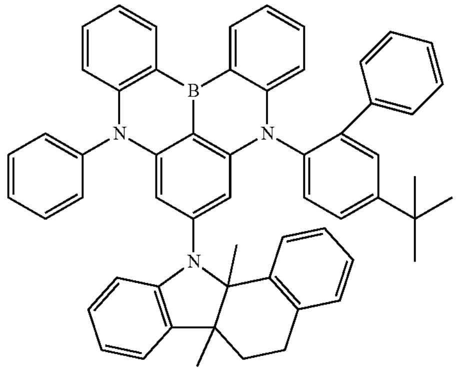
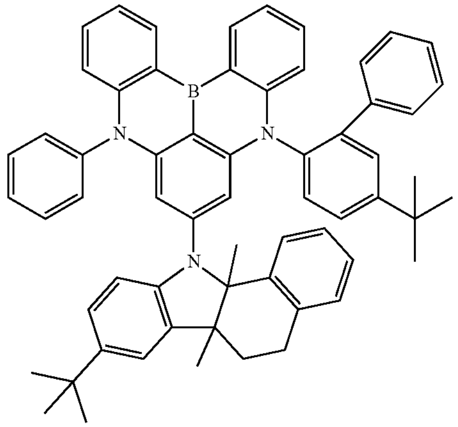 [SMILES: CC(C)(C)c1ccc(N2c3ccccc3B3c4ccccc4N(c4ccccc4)c4cc(N5c6ccc(C(C)(C)C)cc6C6(C)CCc7ccccc7C56C)cc2c43)c(-c2ccccc2)c1]
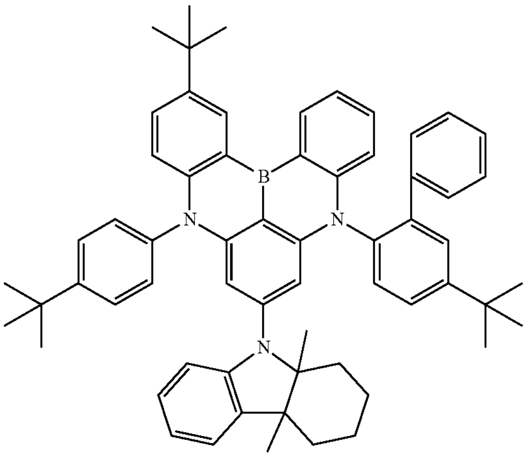
-continued
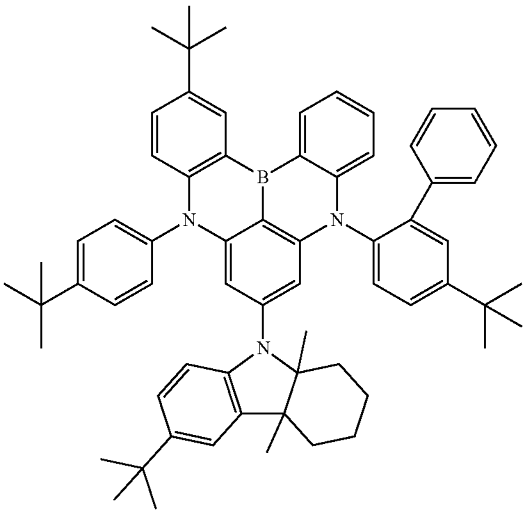
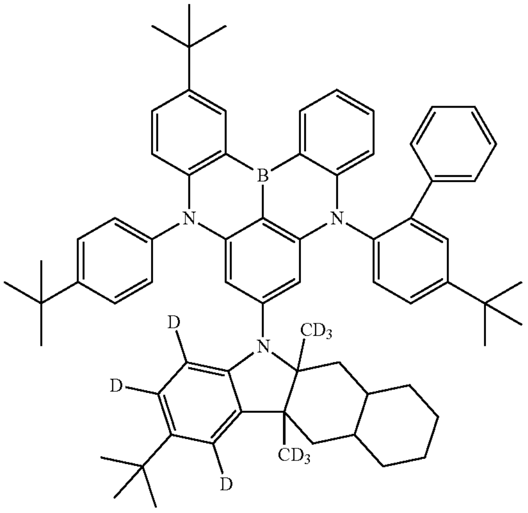
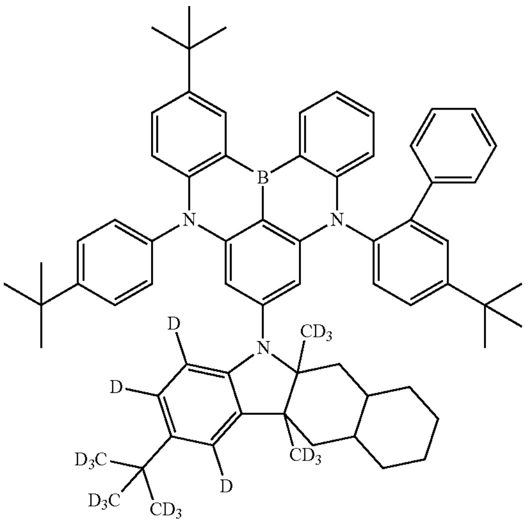 [SMILES: [2H]c1c([2H])c(C(C([2H])([2H])[2H])(C([2H])([2H])[2H])C([2H])([2H])[2H])c([2H])c2c1N(c1cc3c4c(c1)N(c1ccc(C(C)(C)C)cc1-c1ccccc1)c1ccccc1B4c1cc(C(C)(C)C)ccc1N3c1ccc(C(C)(C)C)cc1)C1(C([2H])([2H])[2H])CC3CCCCC3CC21C([2H])([2H])[2H]]

-continued
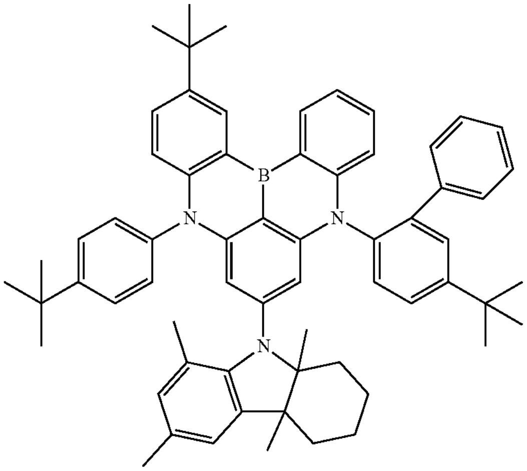
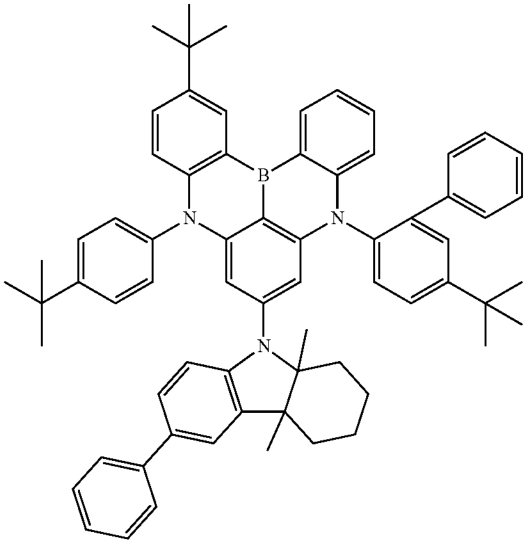
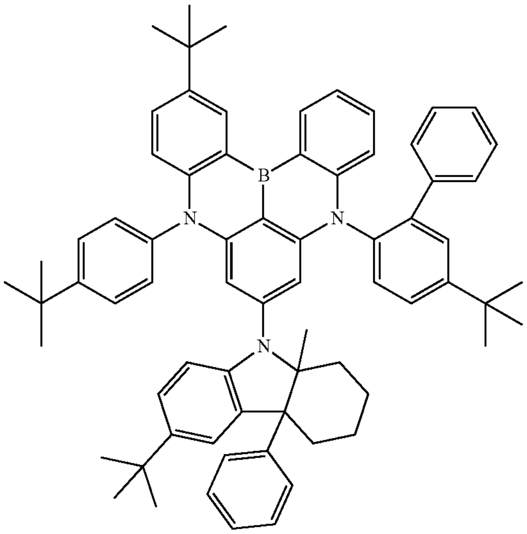
-continued
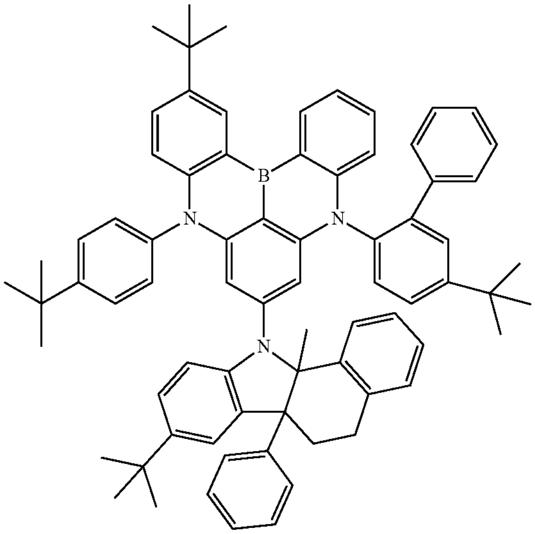 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(C(C)(C)C)cc6C6(c7ccccc7)CCc7ccccc7C56C)cc2c43)cc1]
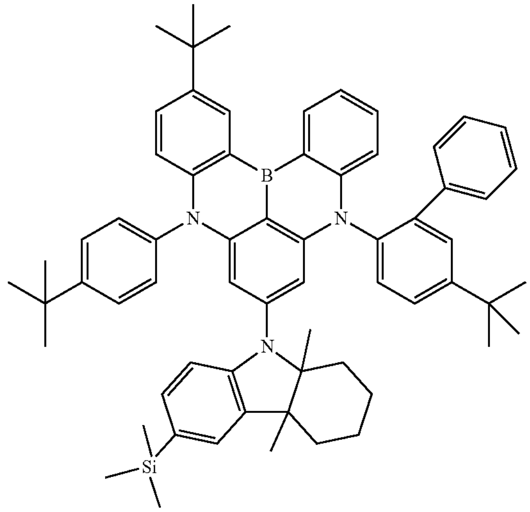
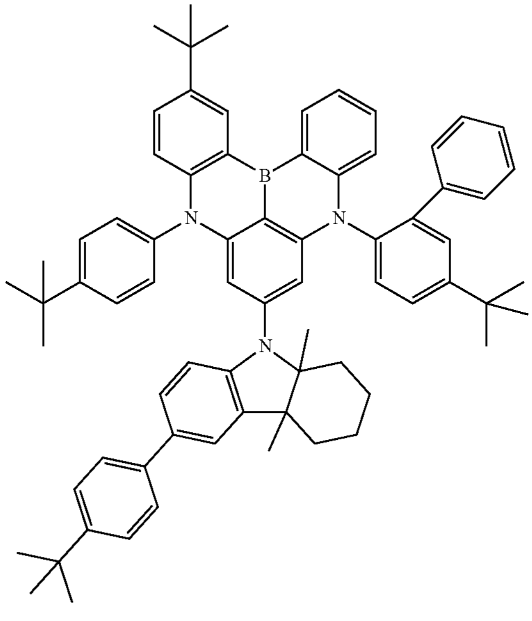

-continued
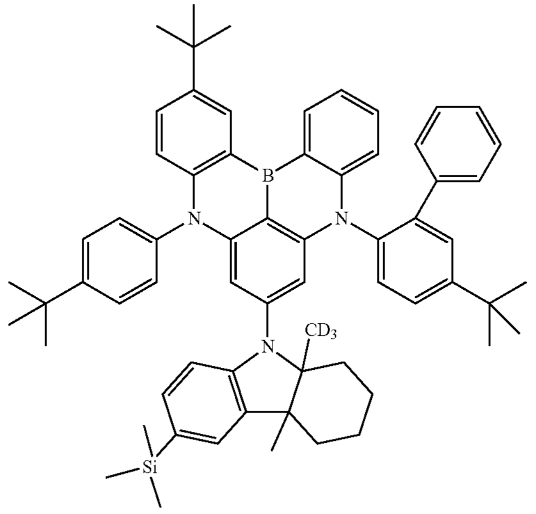
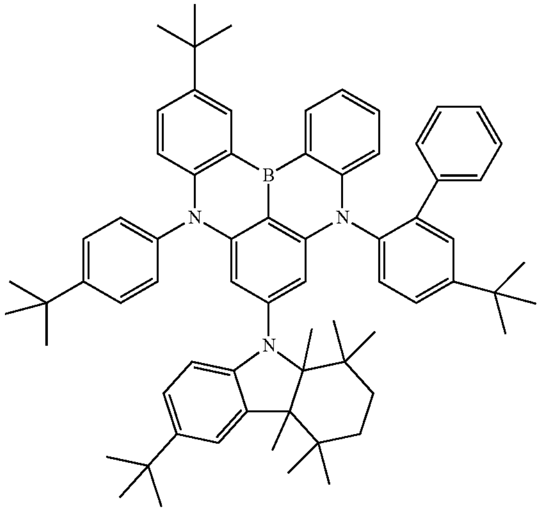 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(C(C)(C)C)cc6C6(C)C(C)(C)CCC(C)(C)C56C)cc2c43)cc1]
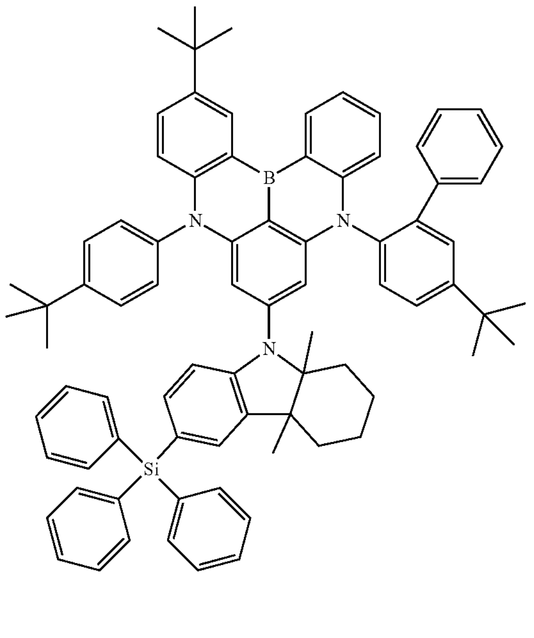
-continued
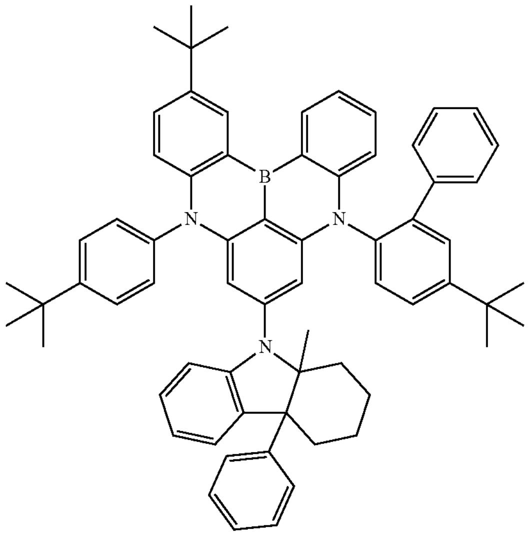
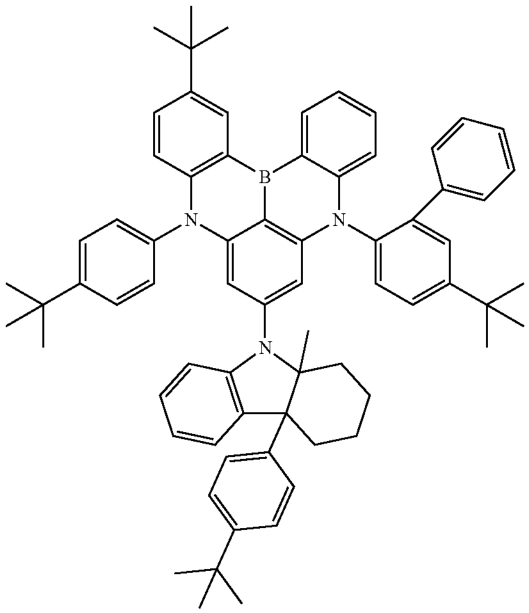

-continued
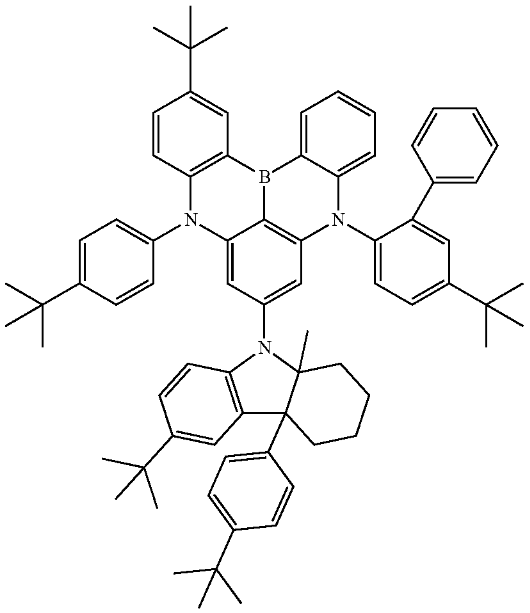 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(C(C)(C)C)cc6C6(c7ccc(C(C)(C)C)cc7)CCCCC56C)cc2c43)cc1]
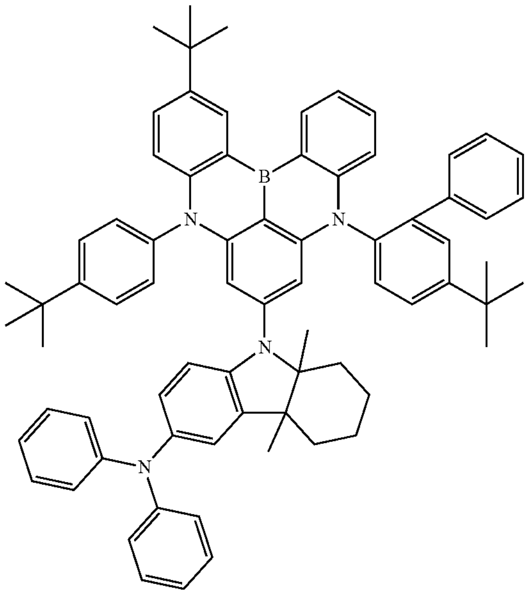
-continued
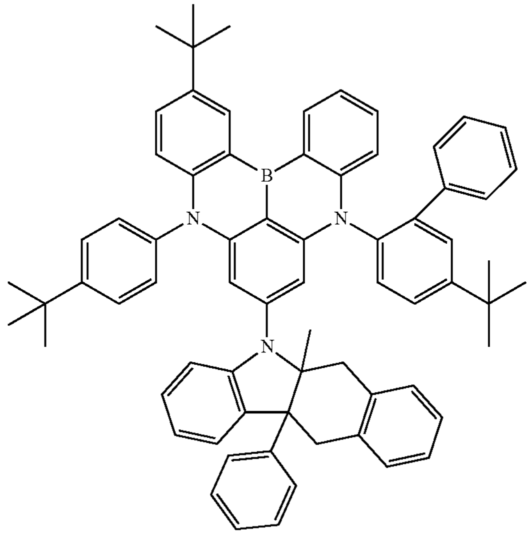
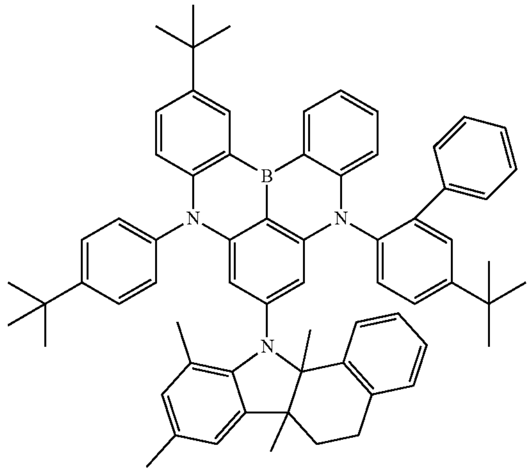
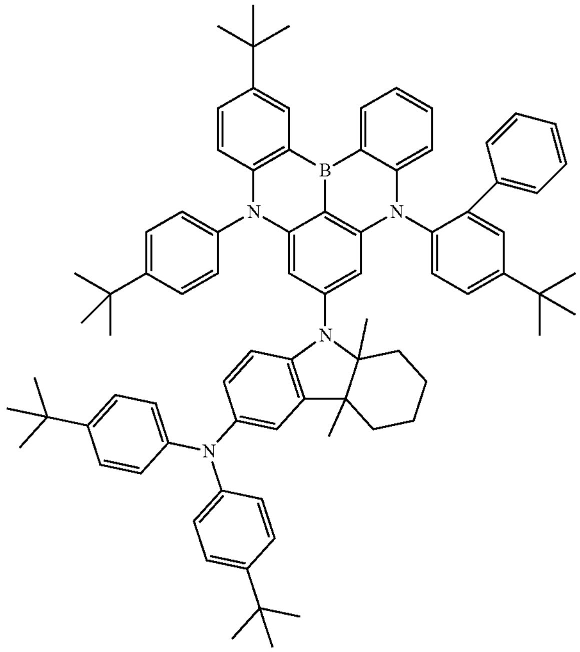 [SMILES: CC(C)(C)c1ccc(N(c2ccc(C(C)(C)C)cc2)c2ccc3c(c2)C2(C)CCCCC2(C)N3c2cc3c4c(c2)N(c2ccc(C(C)(C)C)cc2-c2ccccc2)c2ccccc2B4c2cc(C(C)(C)C)ccc2N3c2ccc(C(C)(C)C)cc2)cc1]

-continued
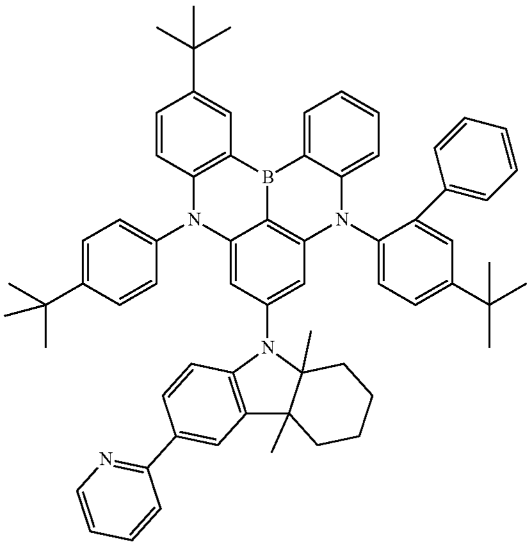
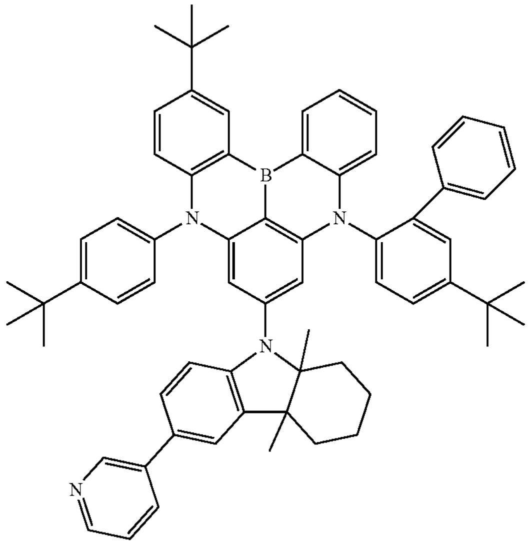
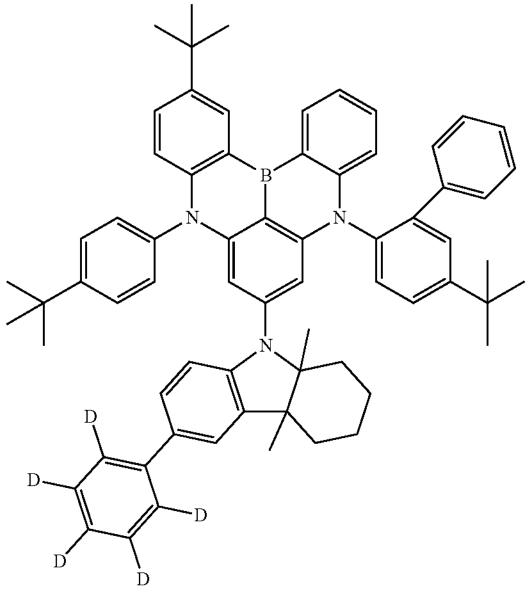
-continued
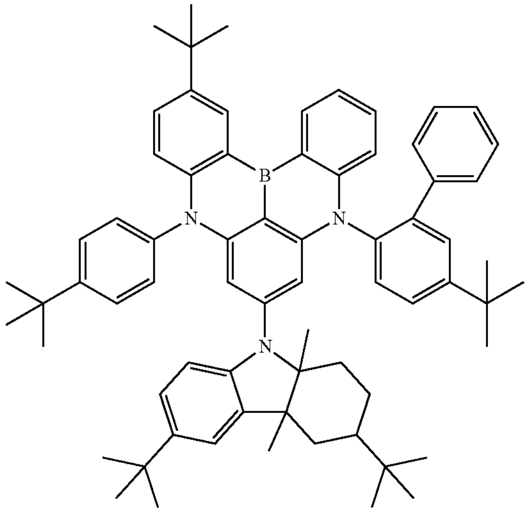 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(C(C)(C)C)cc6C6(C)CC(C(C)(C)C)CCC56C)cc2c43)cc1]
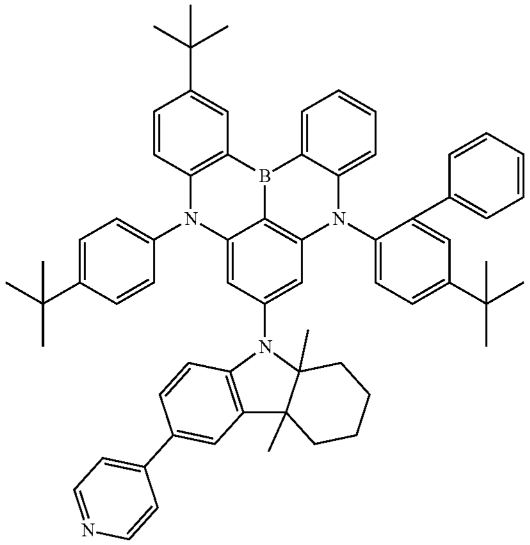
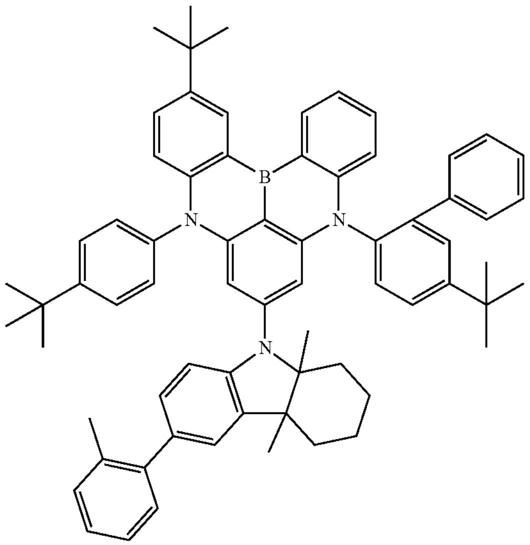

-continued
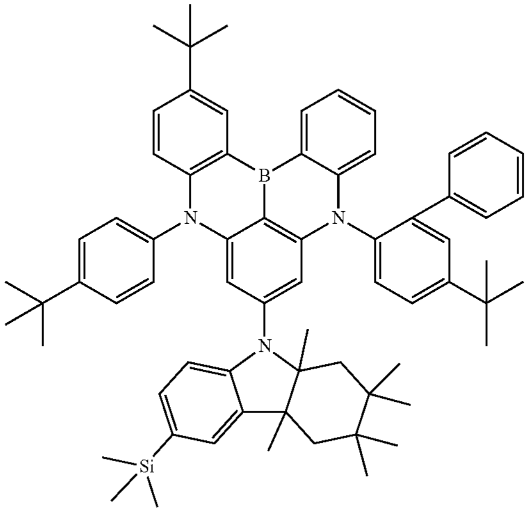
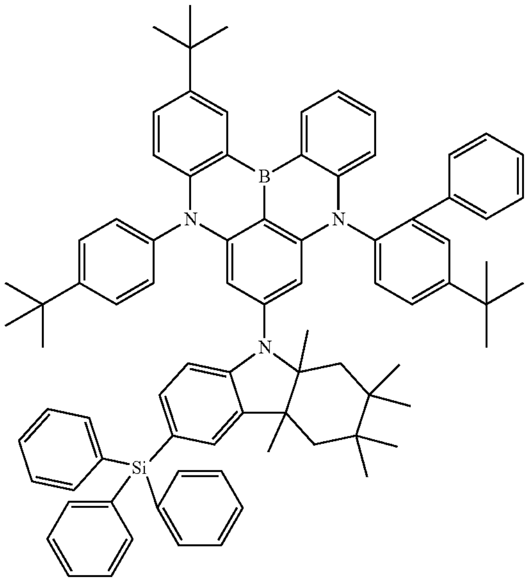 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc([Si](c7ccccc7)(c7ccccc7)c7ccccc7)cc6C6(C)CC(C)(C)C(C)(C)CC56C)cc2c43)cc1]
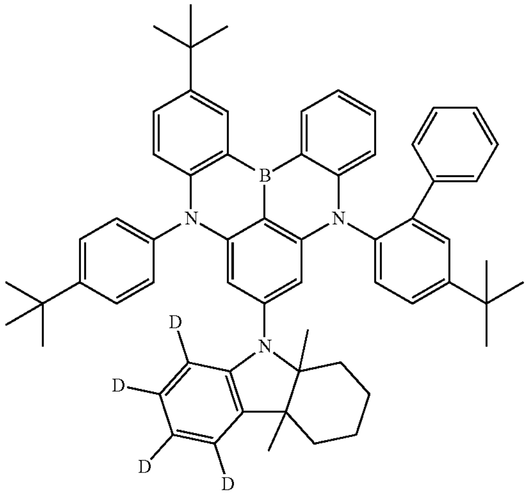
-continued
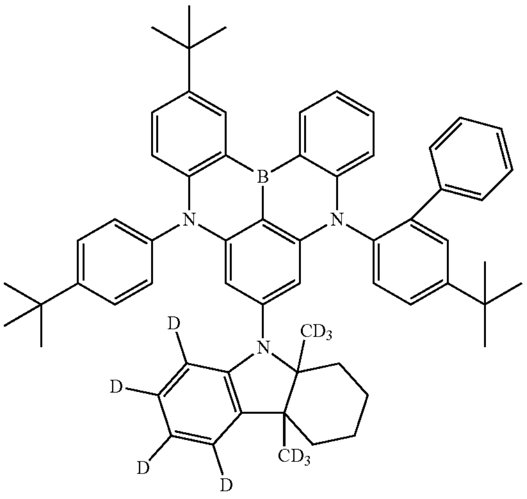
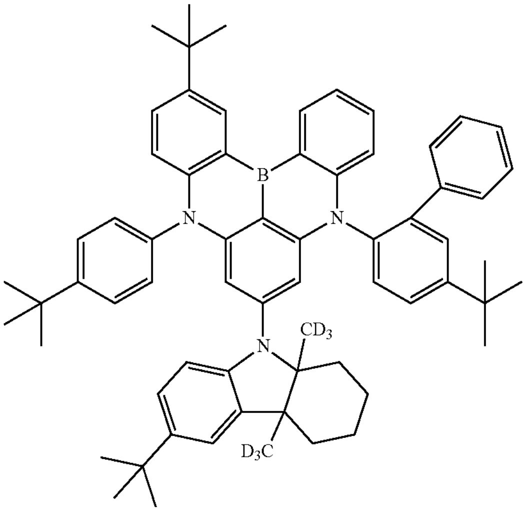
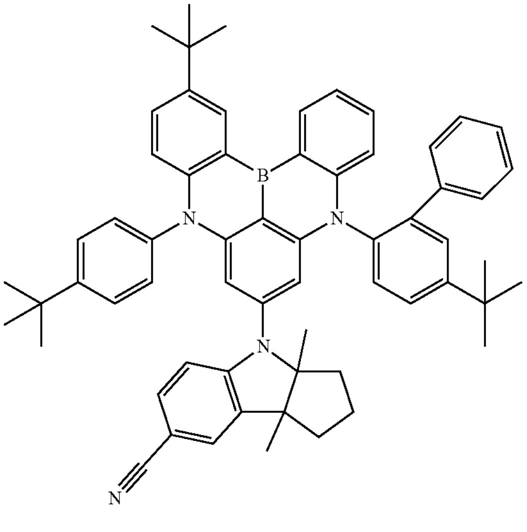 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(C#N)cc6C6(C)CCCC56C)cc2c43)cc1]

-continued
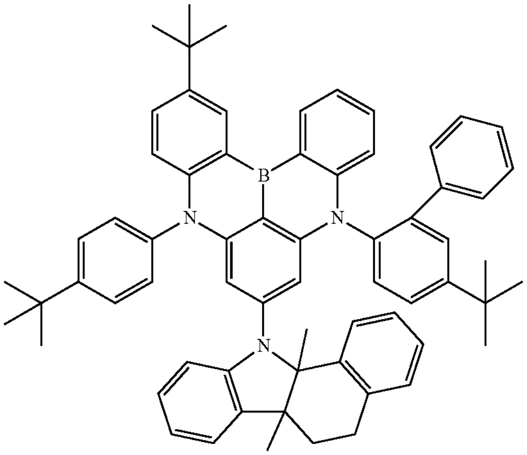
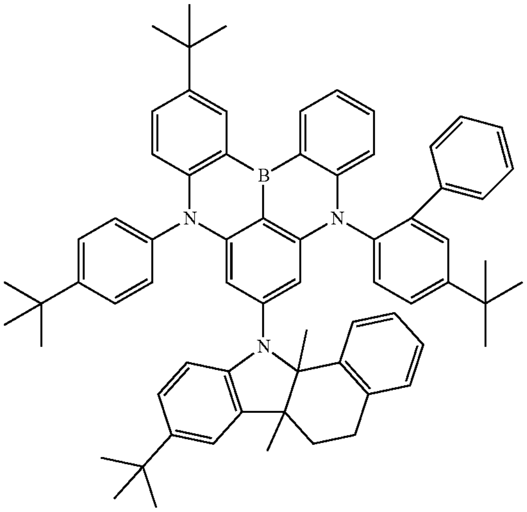
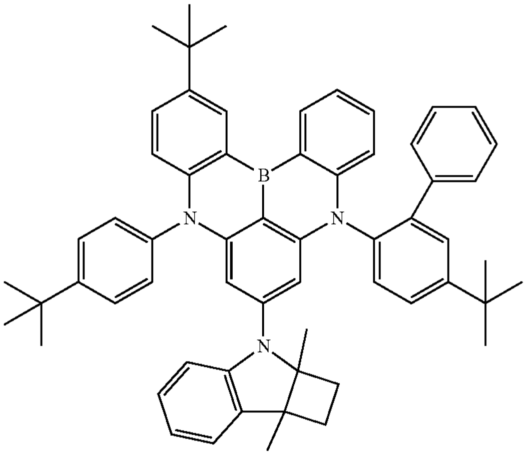
-continued
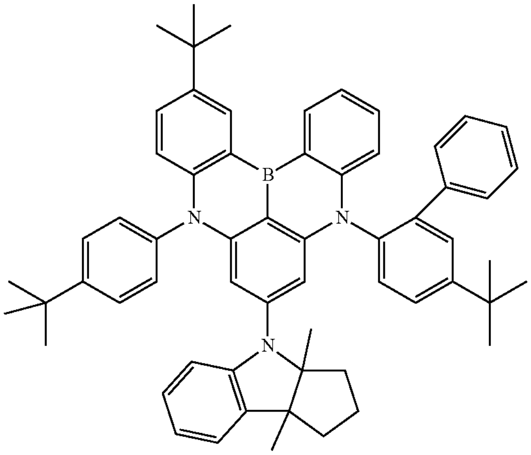 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccccc6C6(C)CCCC56C)cc2c43)cc1]
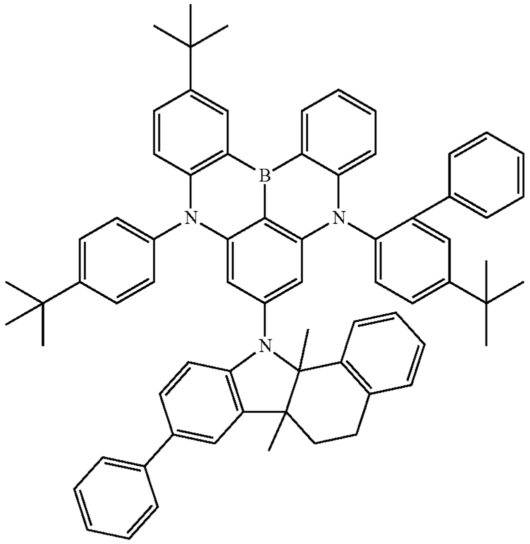
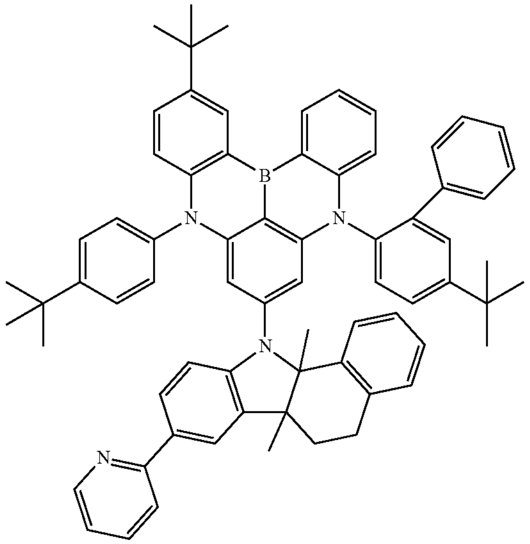

-continued
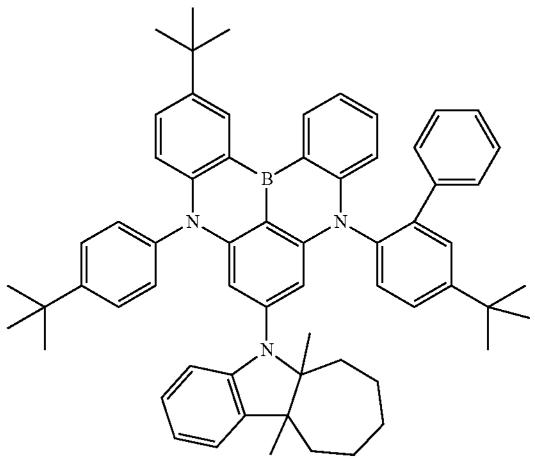
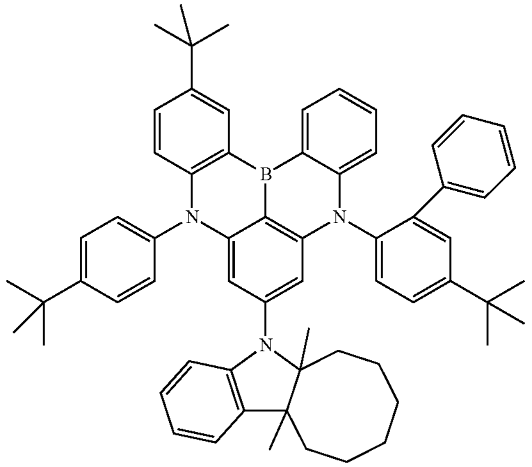 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccccc6C6(C)CCCCCCC56C)cc2c43)cc1]
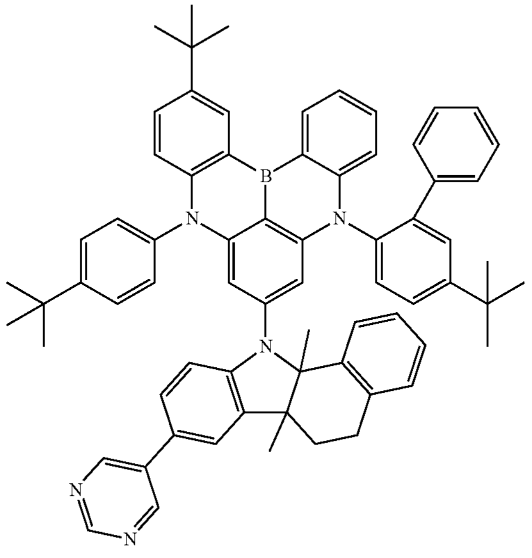
-continued
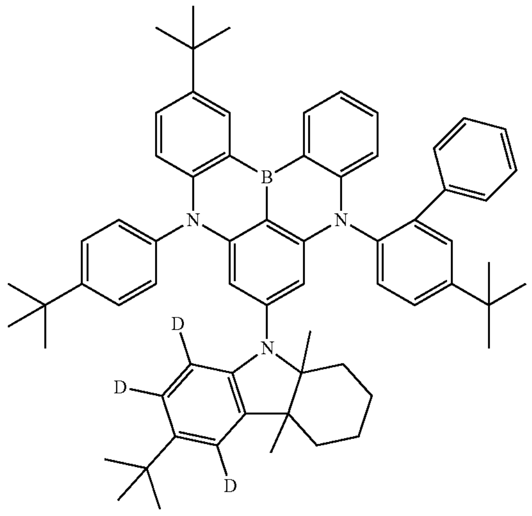
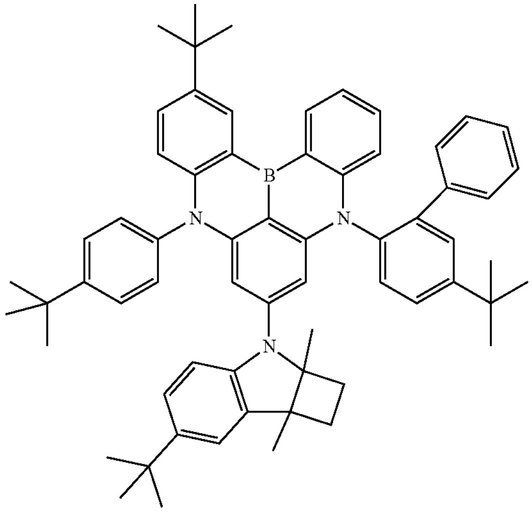
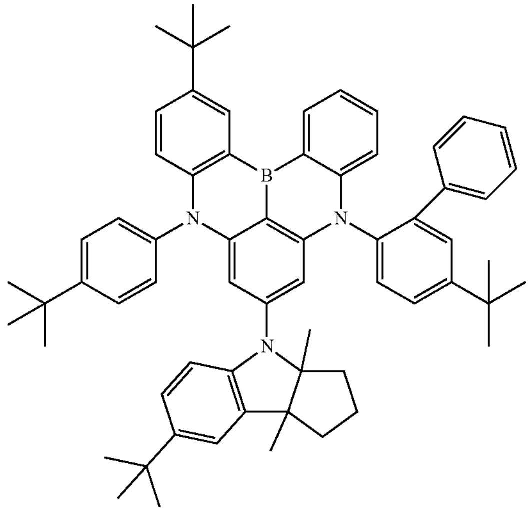 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(C(C)(C)C)cc6C6(C)CCCC56C)cc2c43)cc1]

-continued
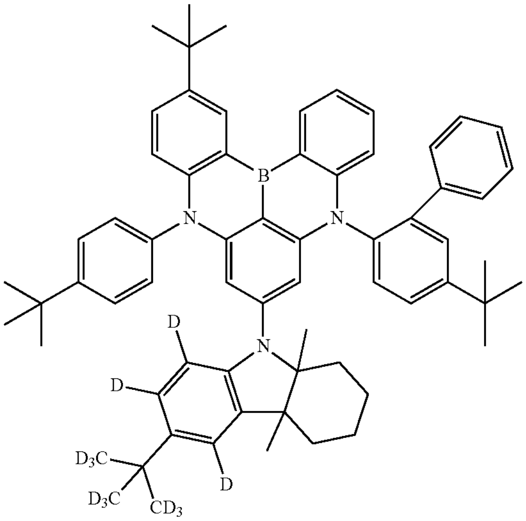
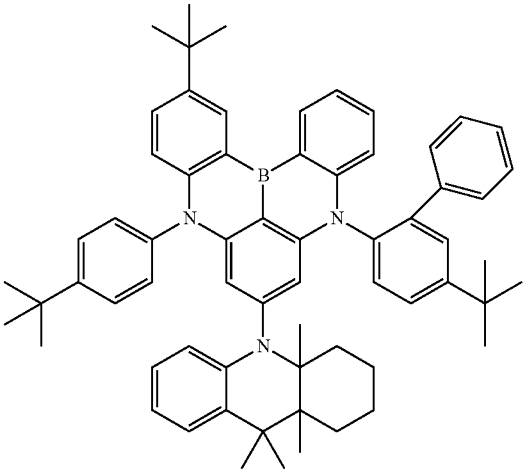
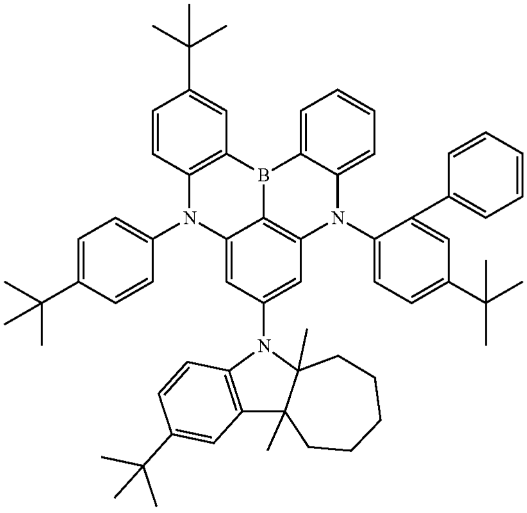
-continued
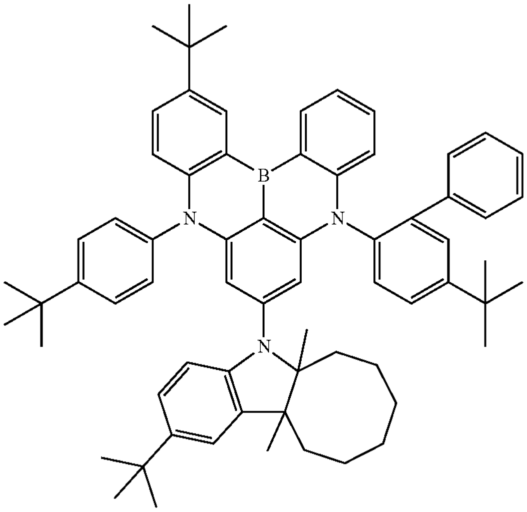 [SMILES: CC(C)(C)c1ccc(N2c3ccc(C(C)(C)C)cc3B3c4ccccc4N(c4ccc(C(C)(C)C)cc4-c4ccccc4)c4cc(N5c6ccc(C(C)(C)C)cc6C6(C)CCCCCCC56C)cc2c43)cc1]
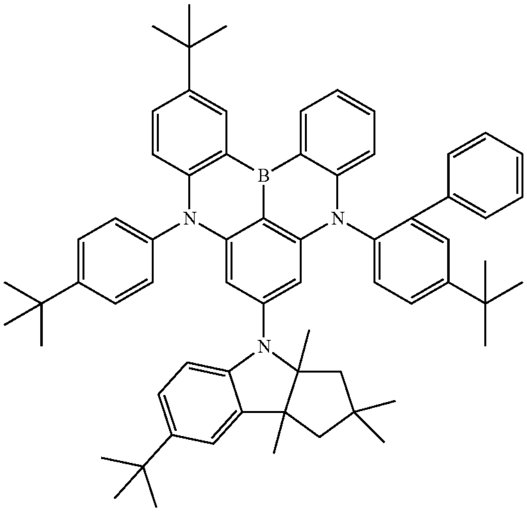
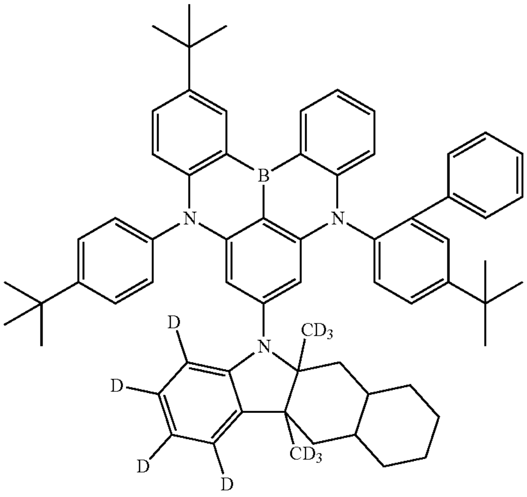

-continued
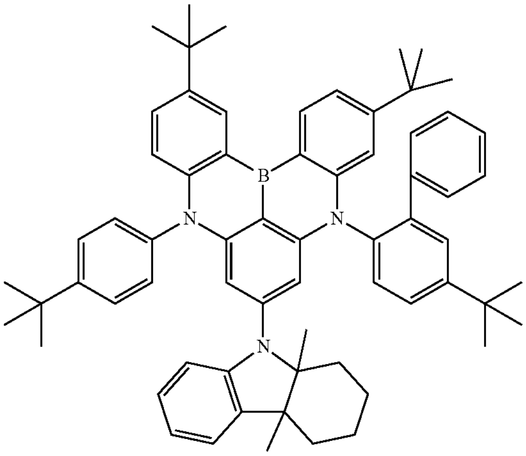
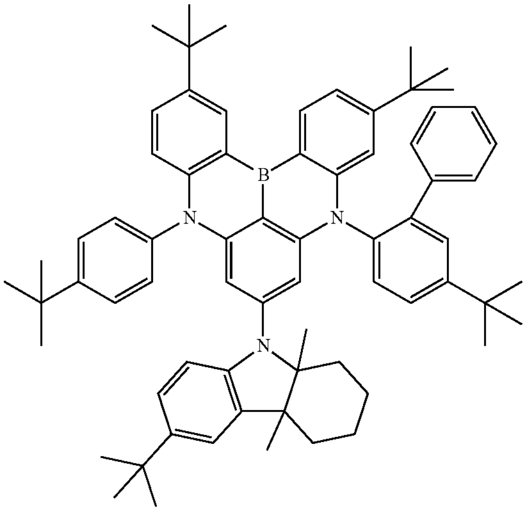
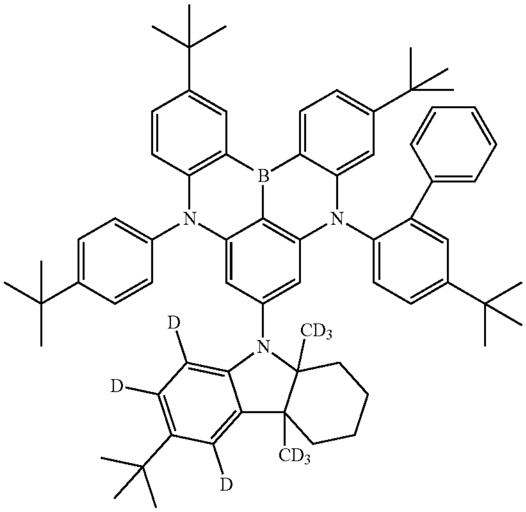
-continued
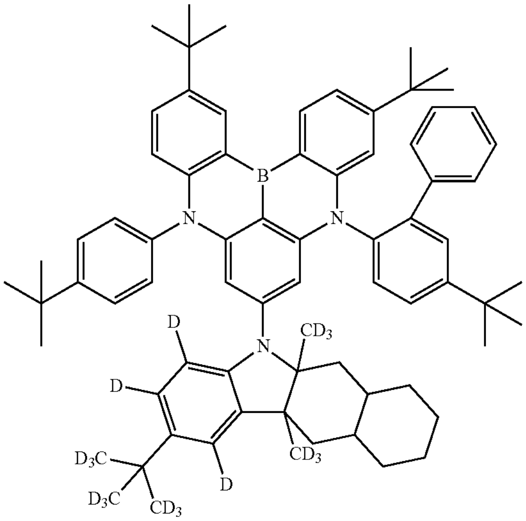 [SMILES: [2H]c1c([2H])c(C(C([2H])([2H])[2H])(C([2H])([2H])[2H])C([2H])([2H])[2H])c([2H])c2c1N(c1cc3c4c(c1)N(c1ccc(C(C)(C)C)cc1-c1ccccc1)c1cc(C(C)(C)C)ccc1B4c1cc(C(C)(C)C)ccc1N3c1ccc(C(C)(C)C)cc1)C1(C([2H])([2H])[2H])CC3CCCCC3CC21C([2H])([2H])[2H]]
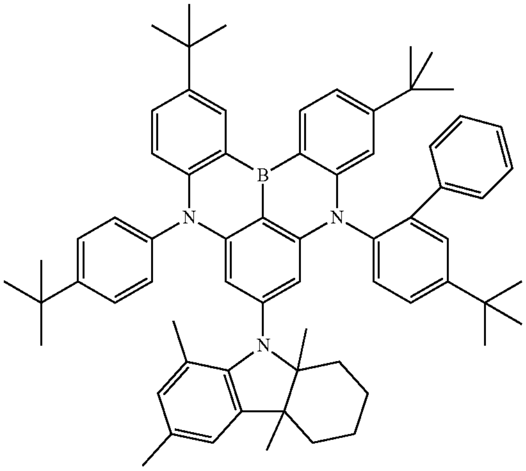
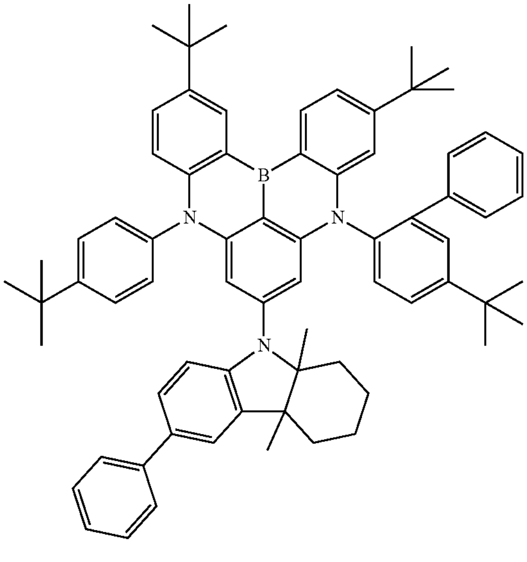

-continued
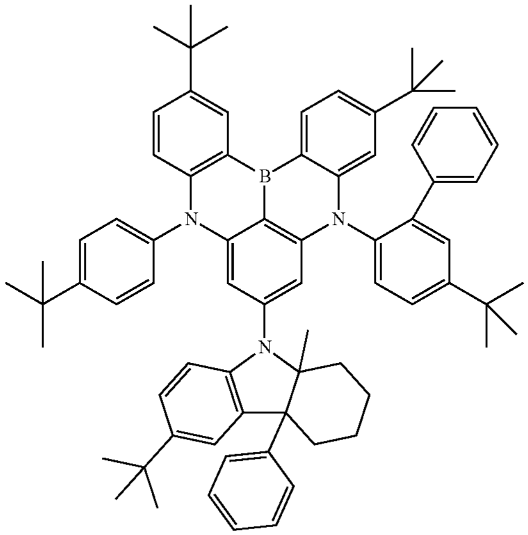
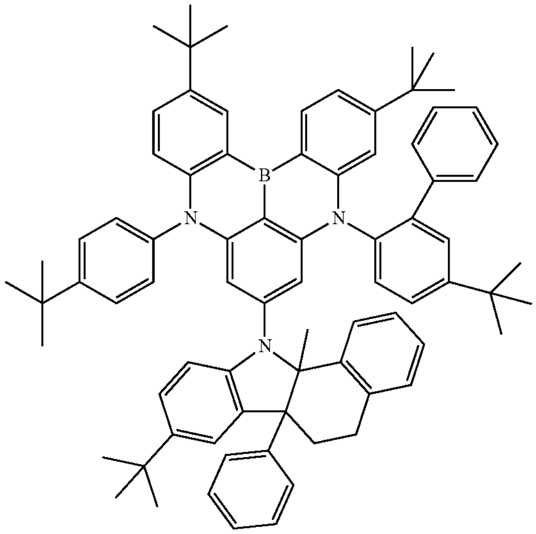 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc(C(C)(C)C)cc6C6(c7ccccc7)CCc7ccccc7C56C)cc2c43)cc1]
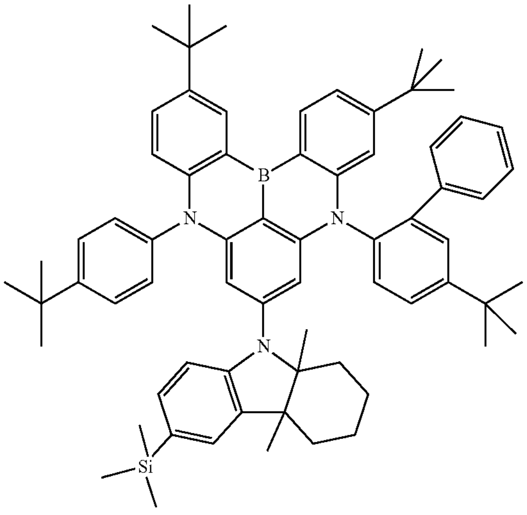
-continued
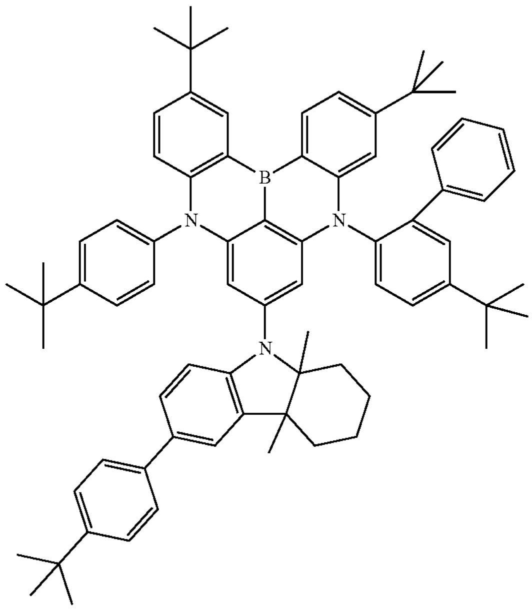
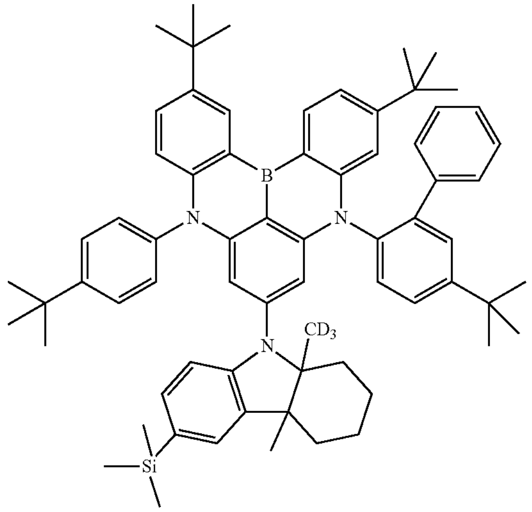
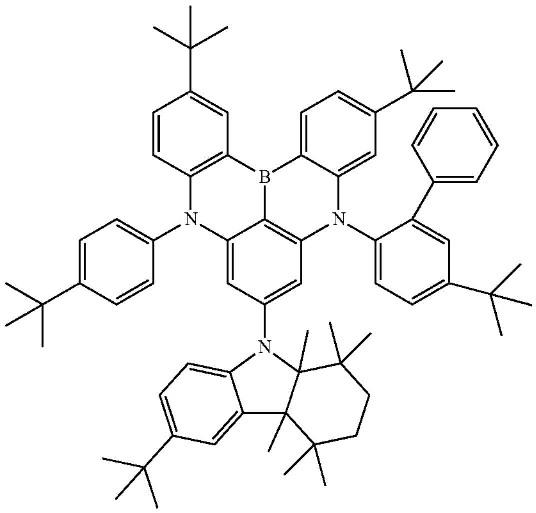 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc(C(C)(C)C)cc6C6(C)C(C)(C)CCC(C)(C)C56C)cc2c43)cc1]

-continued
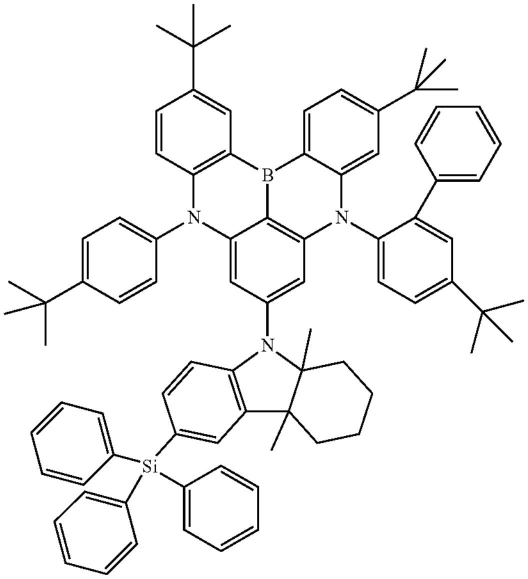
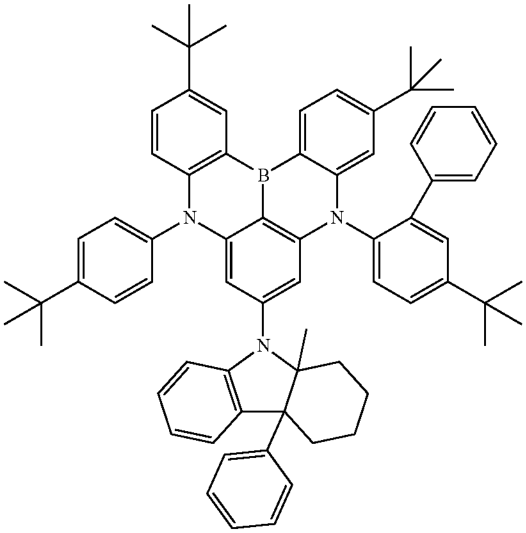
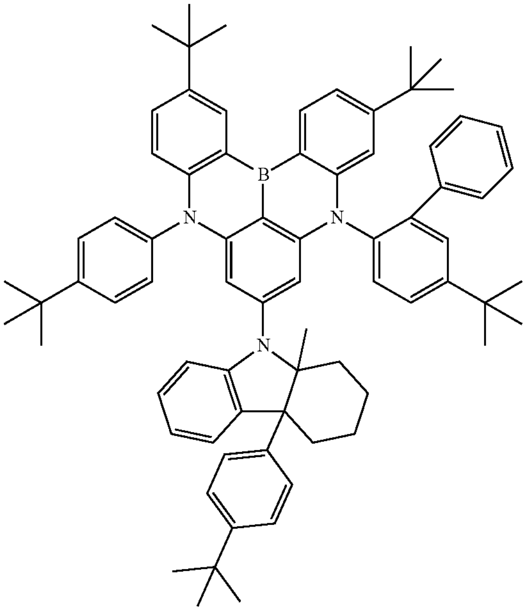
-continued
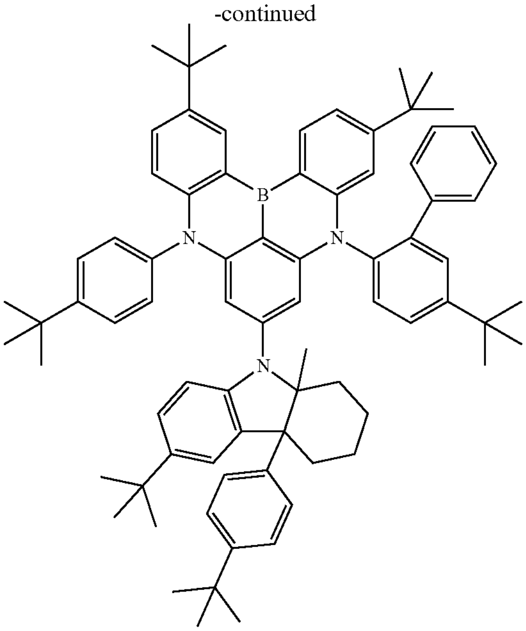
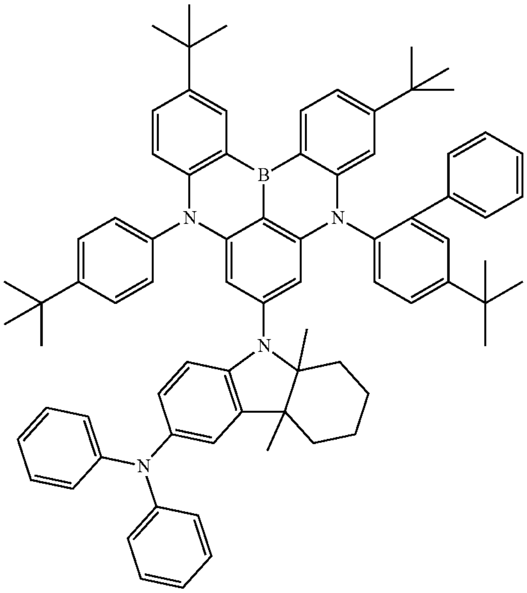
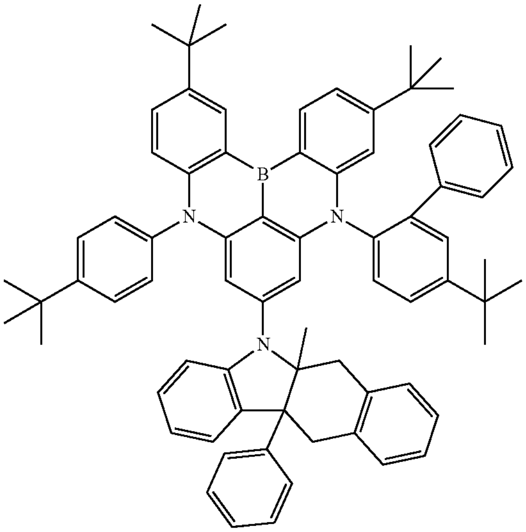

-continued
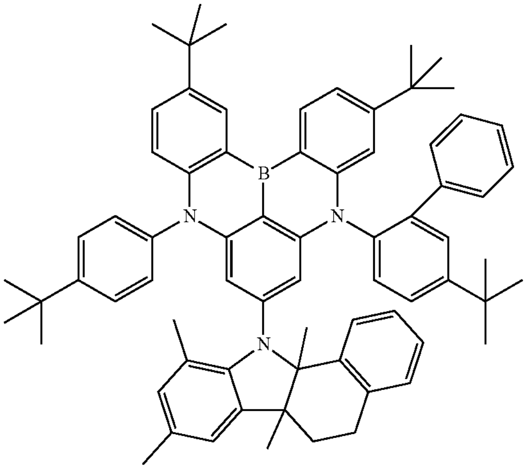
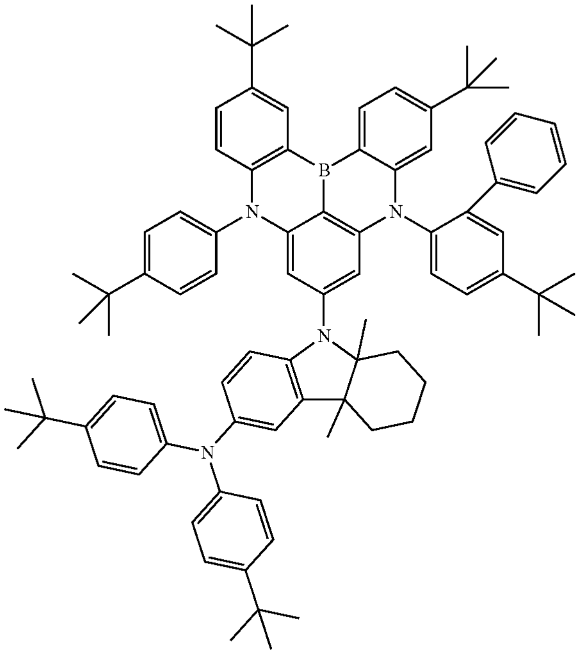 [SMILES: CC(C)(C)c1ccc(N(c2ccc(C(C)(C)C)cc2)c2ccc3c(c2)C2(C)CCCCC2(C)N3c2cc3c4c(c2)N(c2ccc(C(C)(C)C)cc2-c2ccccc2)c2cc(C(C)(C)C)ccc2B4c2cc(C(C)(C)C)ccc2N3c2ccc(C(C)(C)C)cc2)cc1]
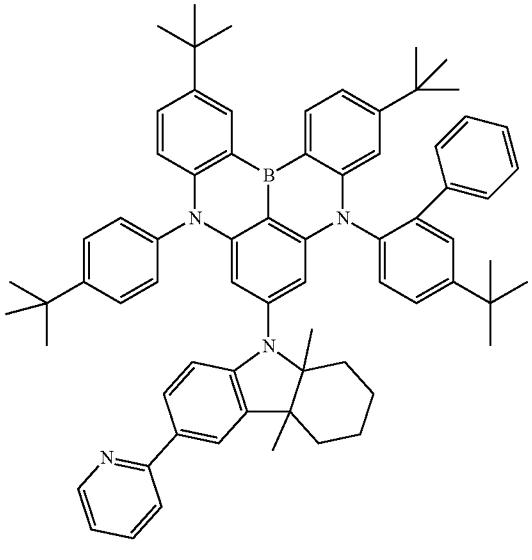
-continued
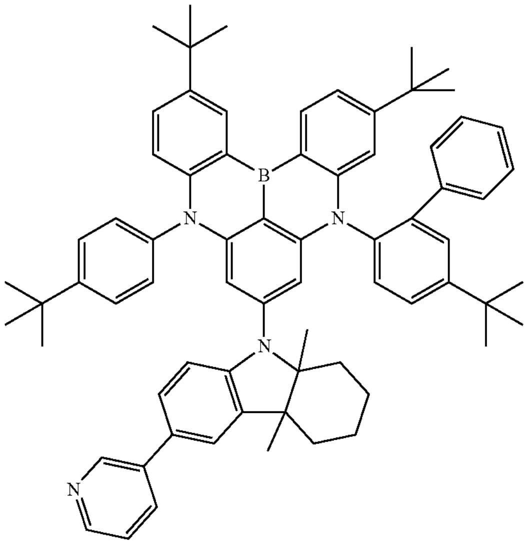
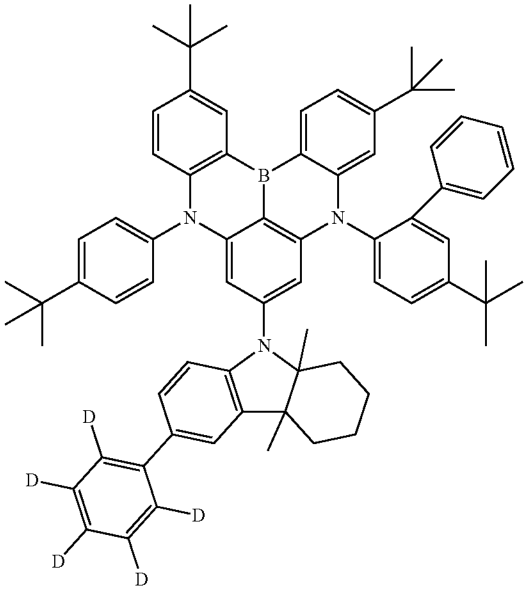
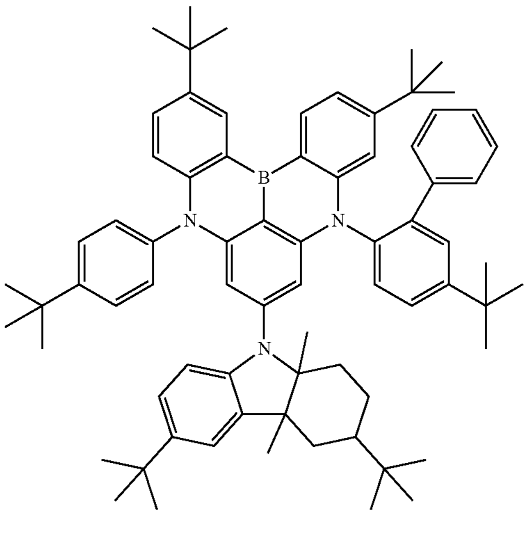 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc(C(C)(C)C)cc6C6(C)CC(C(C)(C)C)CCC56C)cc2c43)cc1]

-continued
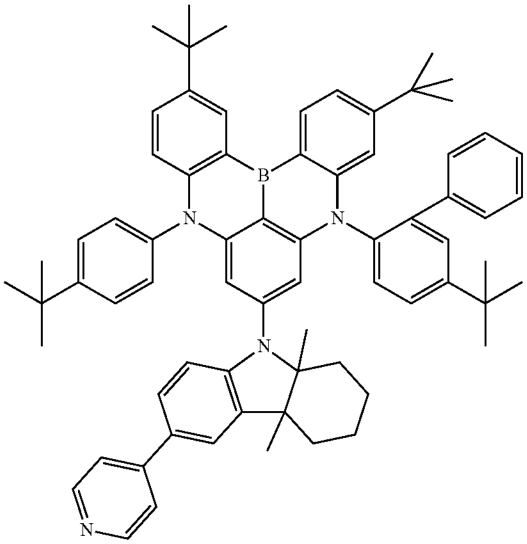
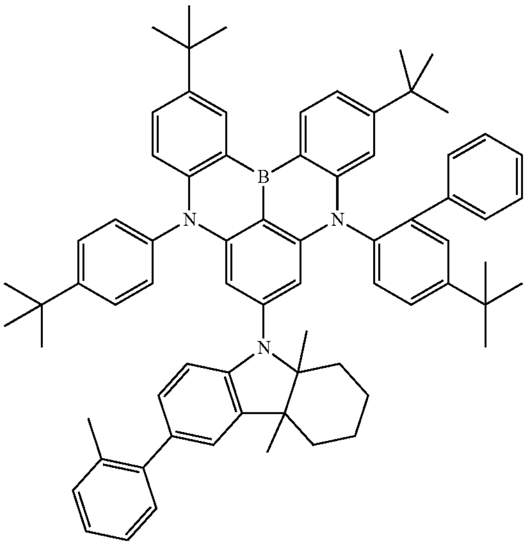
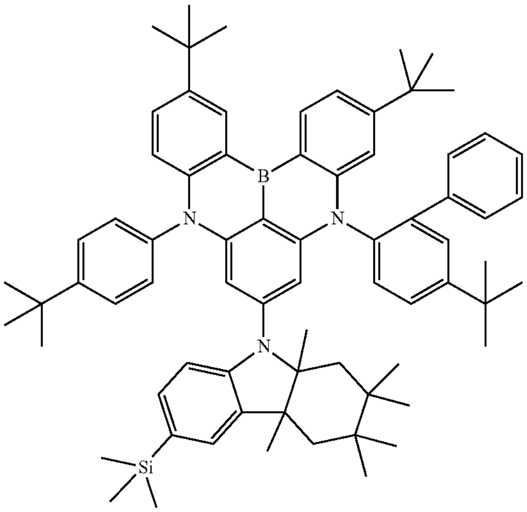
-continued
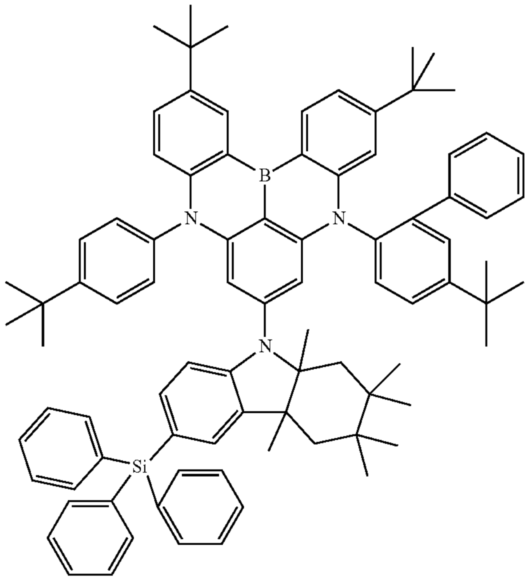 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc([Si](c7ccccc7)(c7ccccc7)c7ccccc7)cc6C6(C)CC(C)(C)C(C)(C)CC56C)cc2c43)cc1]
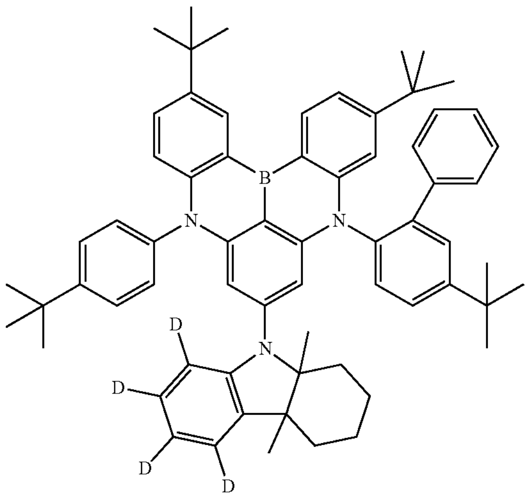
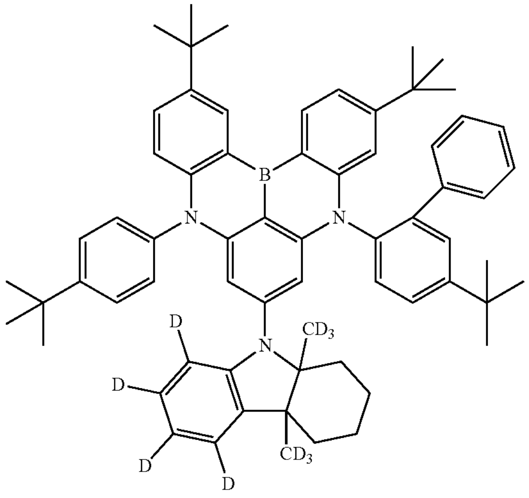

-continued
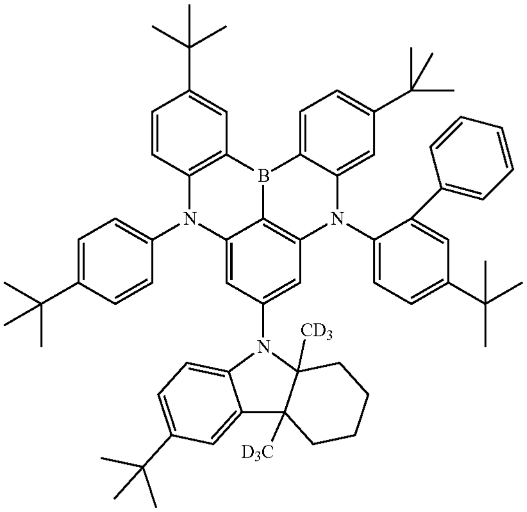
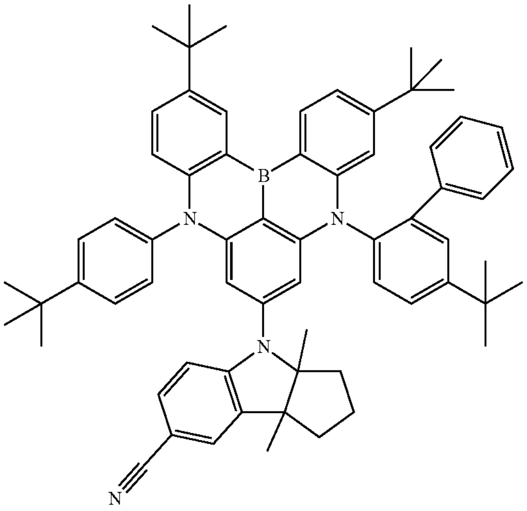 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc(C#N)cc6C6(C)CCCC56C)cc2c43)cc1]
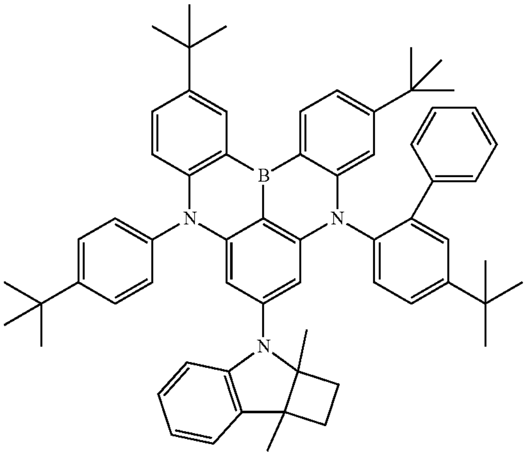
-continued
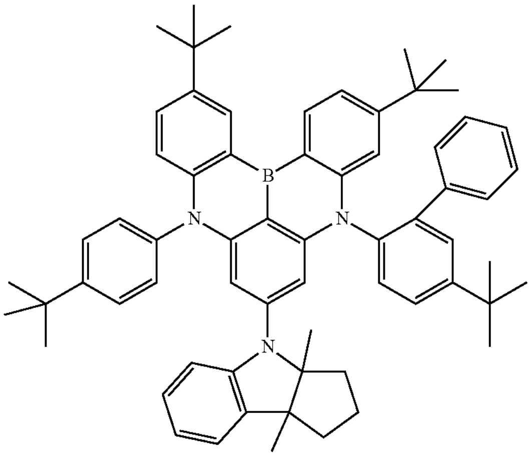
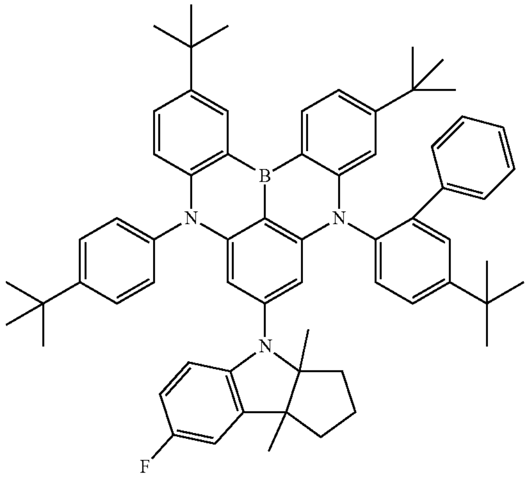
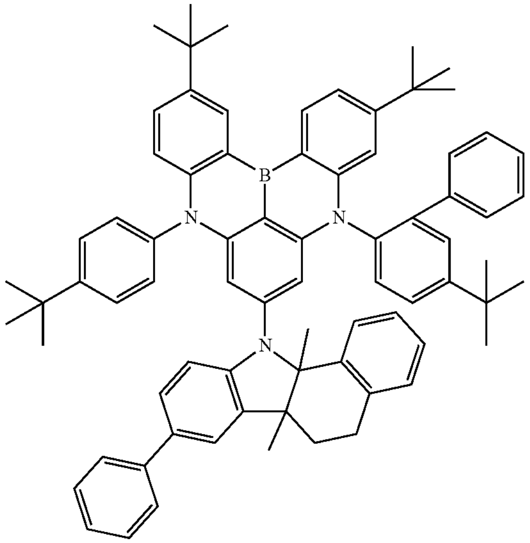

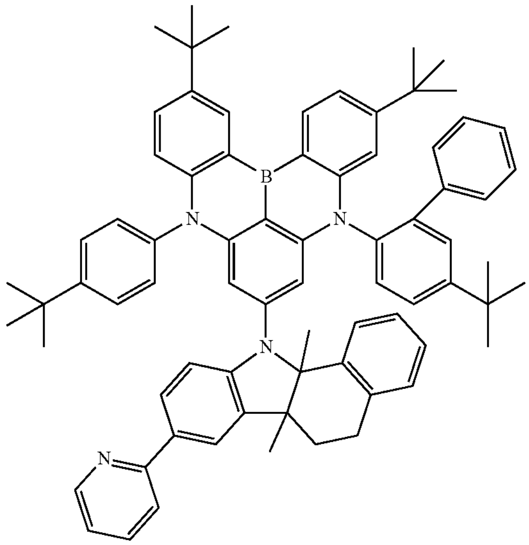
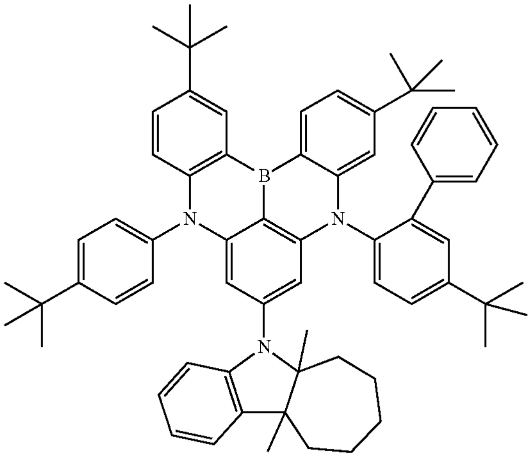
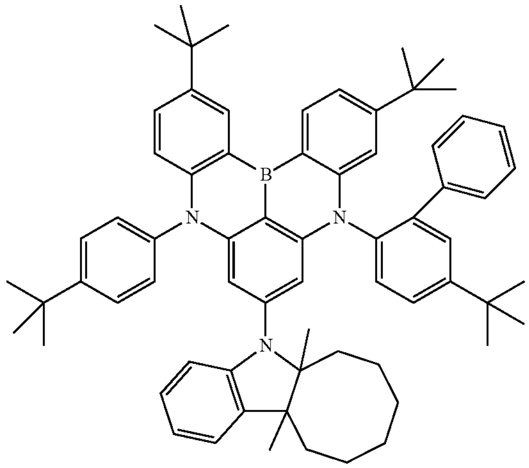 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccccc6C6(C)CCCCCCC56C)cc2c43)cc1]
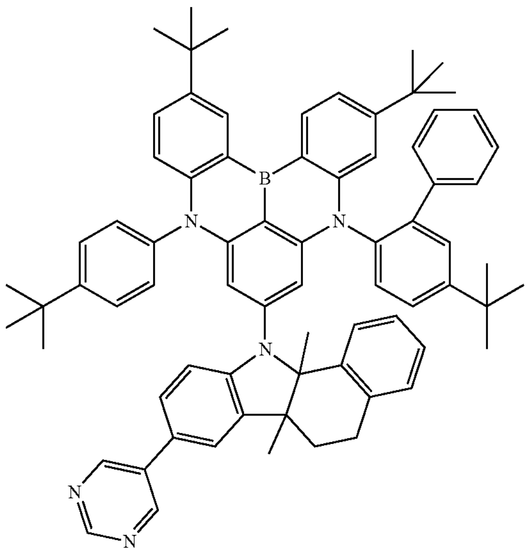
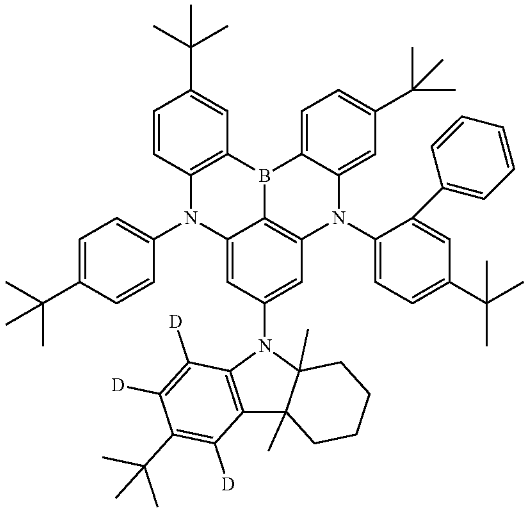
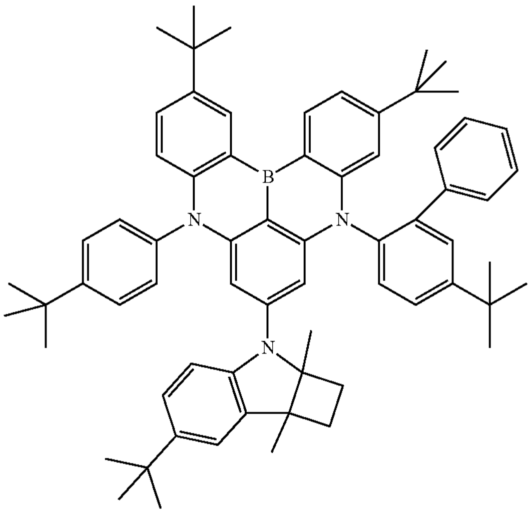

-continued
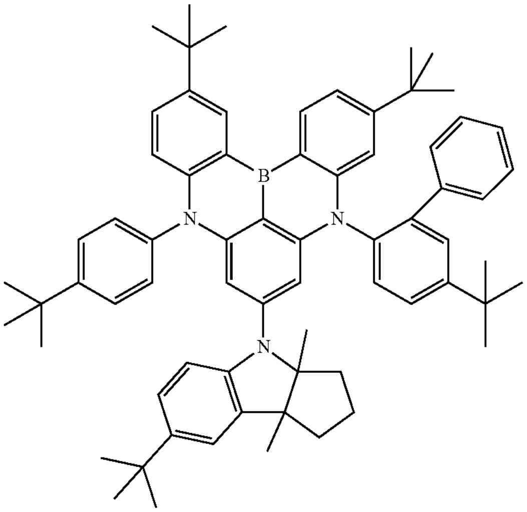 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc(C(C)(C)C)cc6C6(C)CCCC56C)cc2c43)cc1]
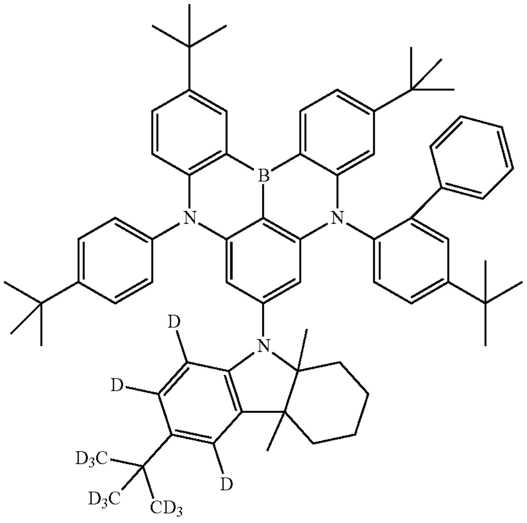
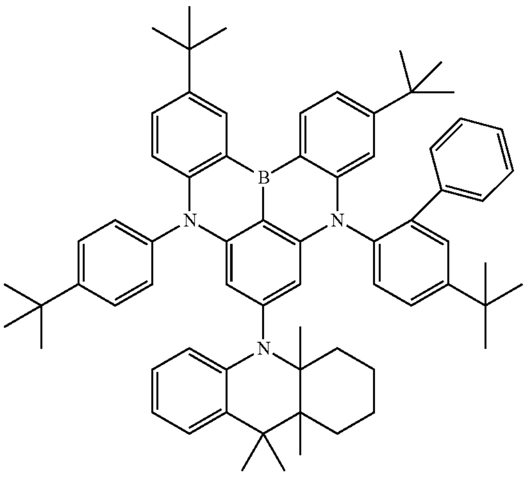
-continued
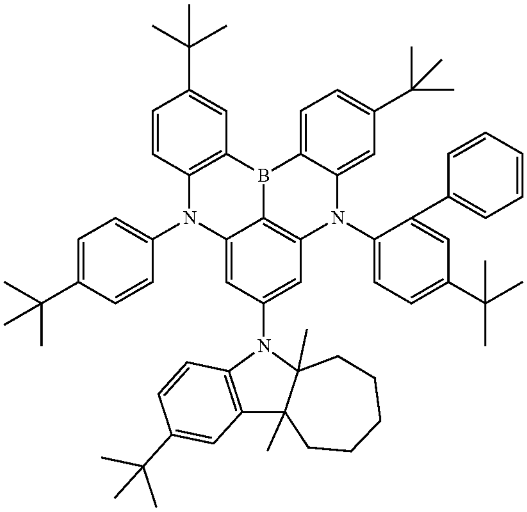
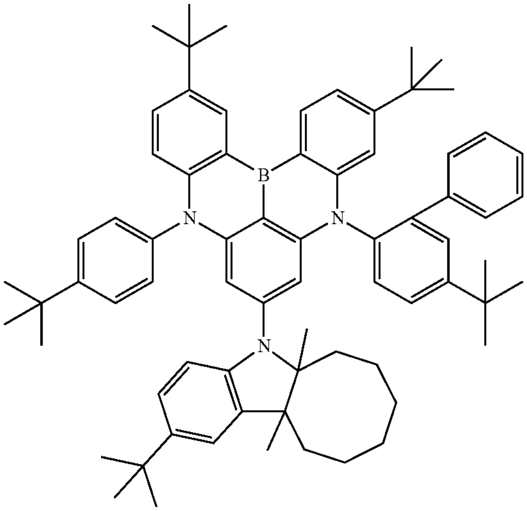 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc(C(C)(C)C)cc6C6(C)CCCCCCC56C)cc2c43)cc1]
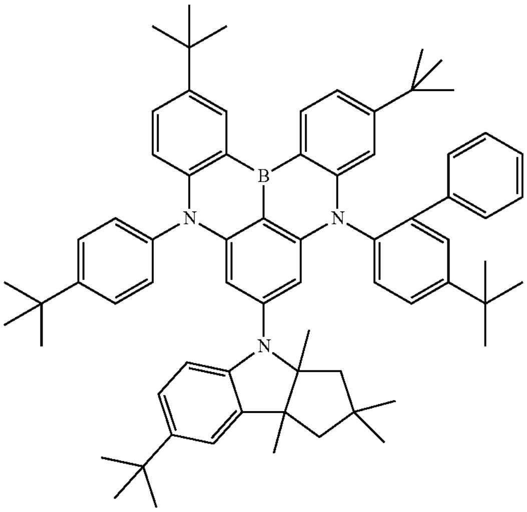

-continued
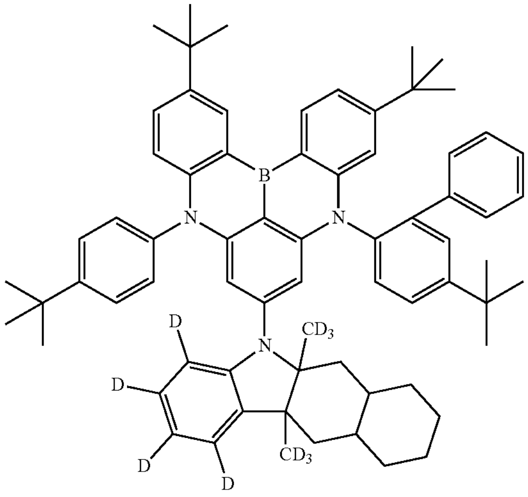
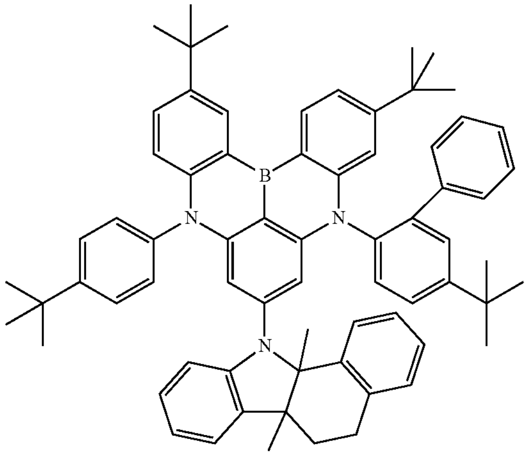
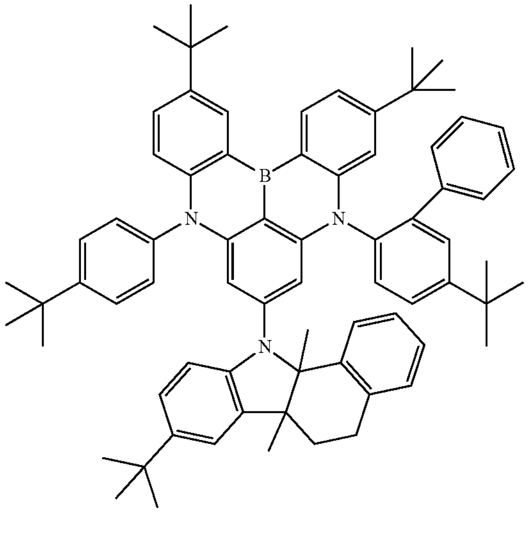 [SMILES: CC(C)(C)c1ccc(N2c3ccc(C(C)(C)C)cc3B3c4ccc(C(C)(C)C)cc4N(c4ccc(C(C)(C)C)cc4-c4ccccc4)c4cc(N5c6ccc(C(C)(C)C)cc6C6(C)CCc7ccccc7C56C)cc2c43)cc1]
-continued
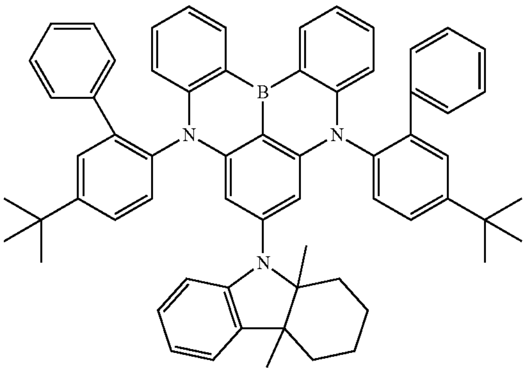
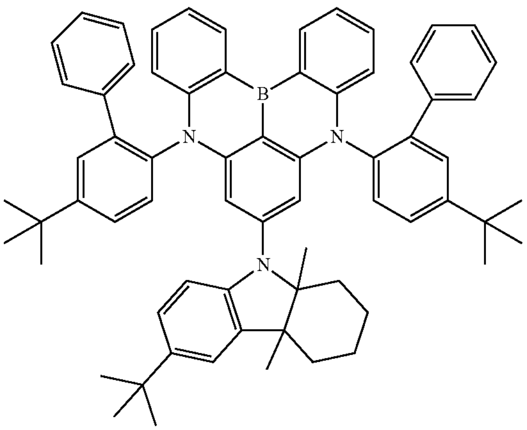
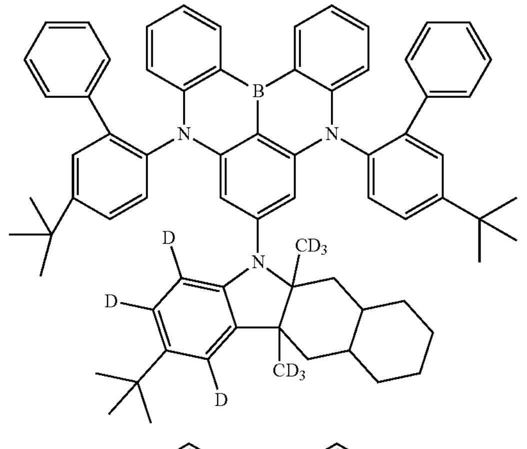
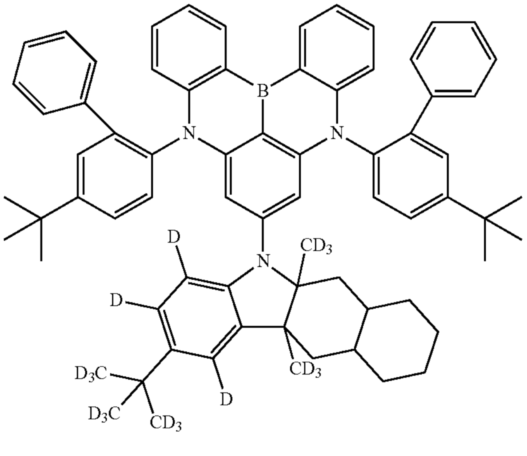 [SMILES: [2H]c1c([2H])c(C(C([2H])([2H])[2H])(C([2H])([2H])[2H])C([2H])([2H])[2H])c([2H])c2c1N(c1cc3c4c(c1)N(c1ccc(C(C)(C)C)cc1-c1ccccc1)c1ccccc1B4c1ccccc1N3c1ccc(C(C)(C)C)cc1-c1ccccc1)C1(C([2H])([2H])[2H])CC3CCCCC3CC21C([2H])([2H])[2H]]

-continued
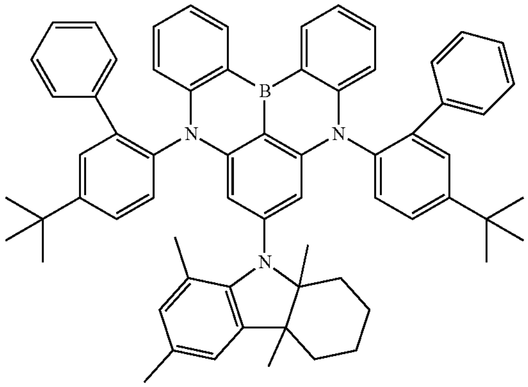
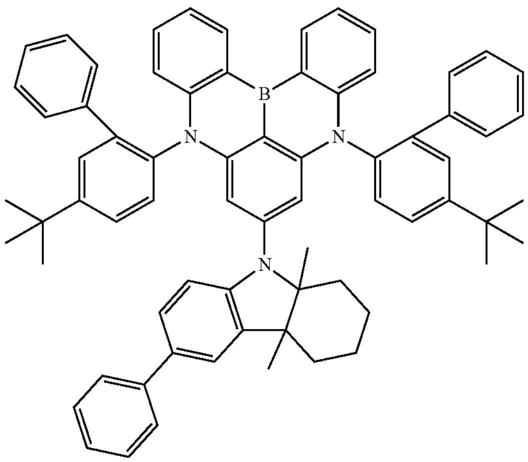
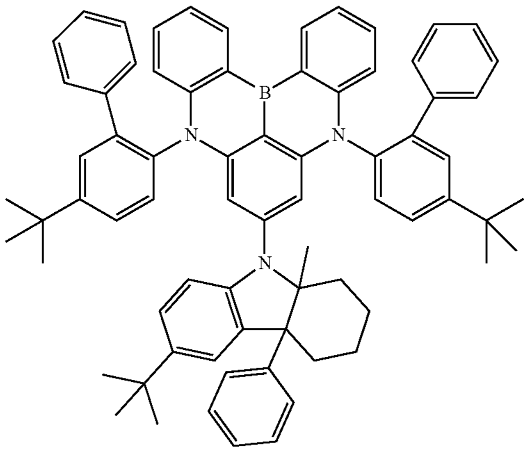
-continued
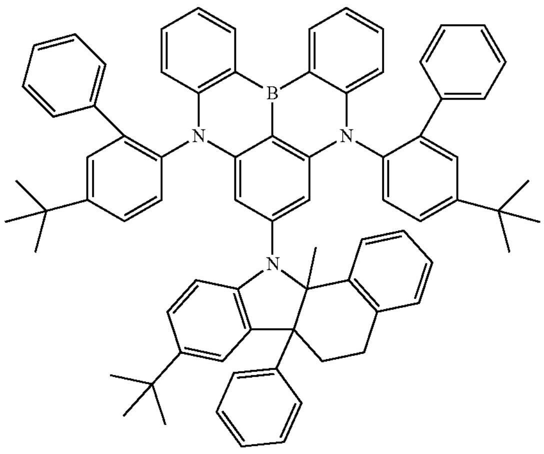 [SMILES: CC(C)(C)c1ccc(N2c3ccccc3B3c4ccccc4N(c4ccc(C(C)(C)C)cc4-c4ccccc4)c4cc(N5c6ccc(C(C)(C)C)cc6C6(c7ccccc7)CCc7ccccc7C56C)cc2c43)c(-c2ccccc2)c1]
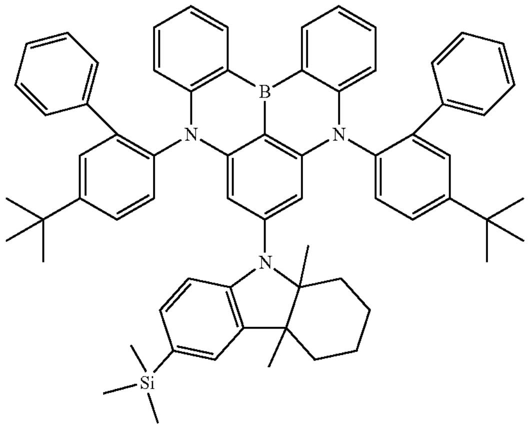
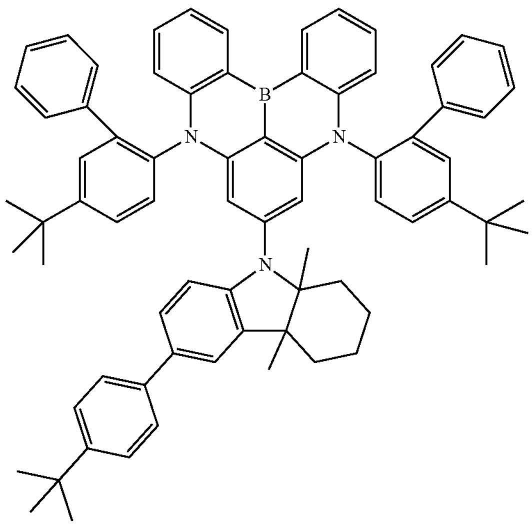

-continued
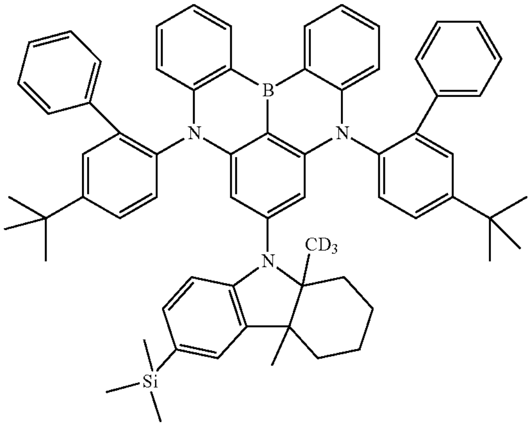
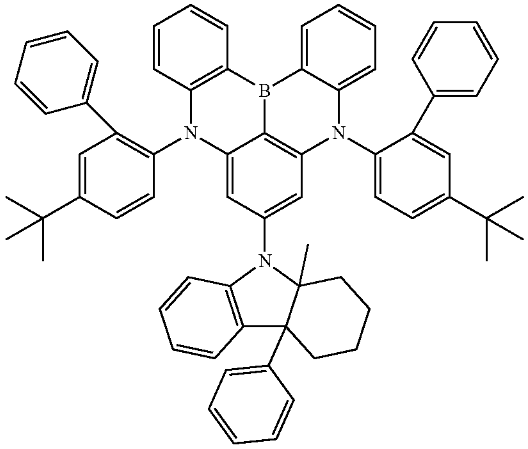
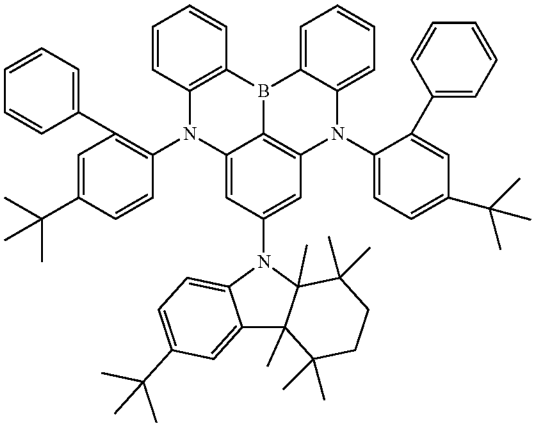 [SMILES: CC(C)(C)c1ccc(N2c3ccccc3B3c4ccccc4N(c4ccc(C(C)(C)C)cc4-c4ccccc4)c4cc(N5c6ccc(C(C)(C)C)cc6C6(C)C(C)(C)CCC(C)(C)C56C)cc2c43)c(-c2ccccc2)c1]
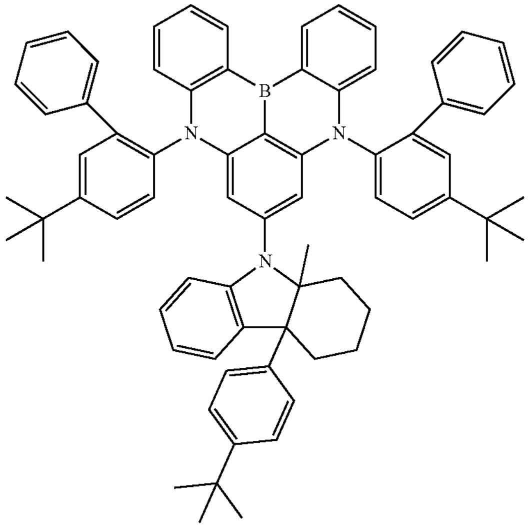
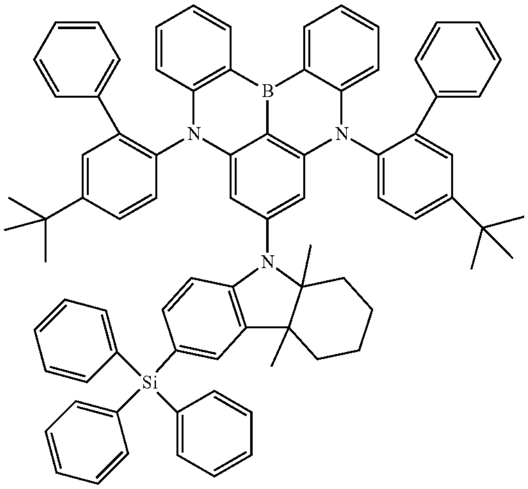
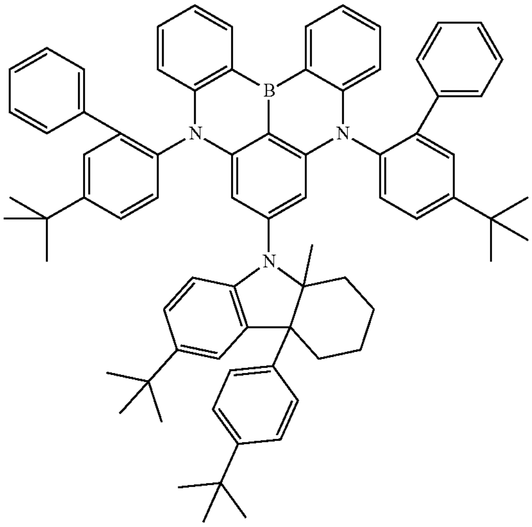 [SMILES: CC(C)(C)c1ccc(C23CCCCC2(C)N(c2cc4c5c(c2)N(c2ccc(C(C)(C)C)cc2-c2ccccc2)c2ccccc2B5c2ccccc2N4c2ccc(C(C)(C)C)cc2-c2ccccc2)c2ccc(C(C)(C)C)cc23)cc1]
-continued -continued
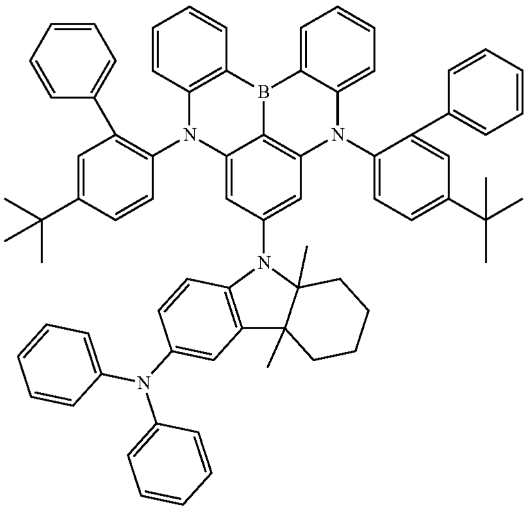
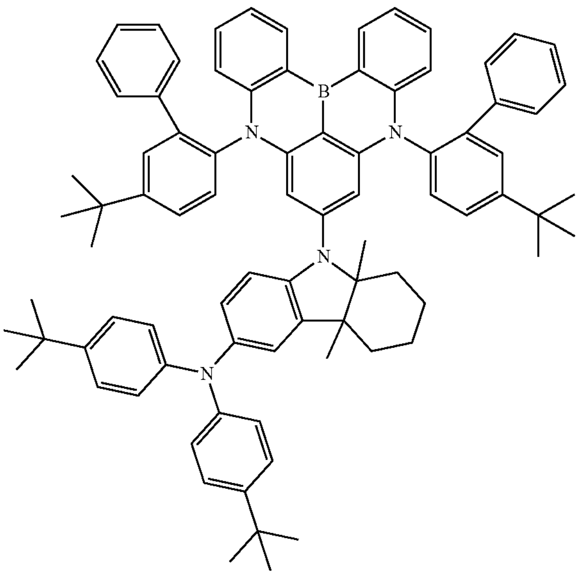
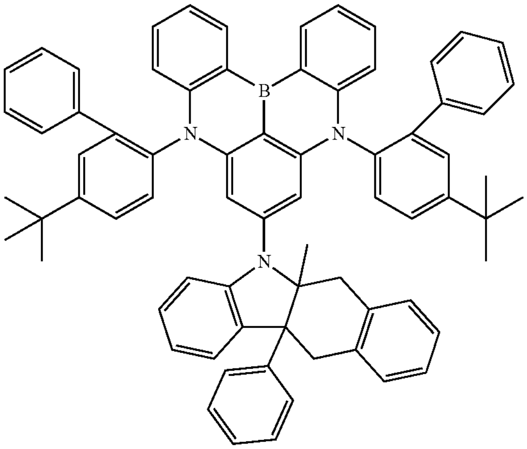
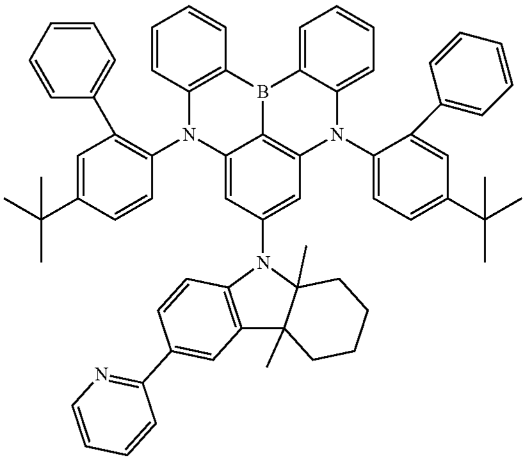
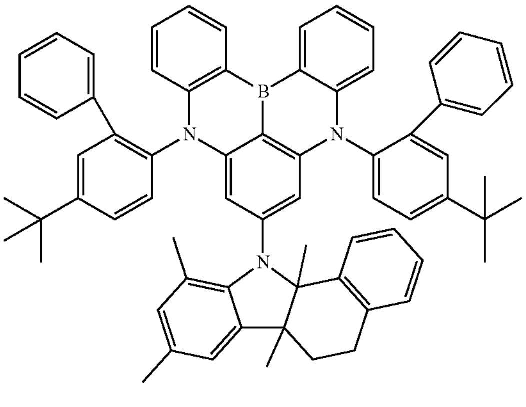
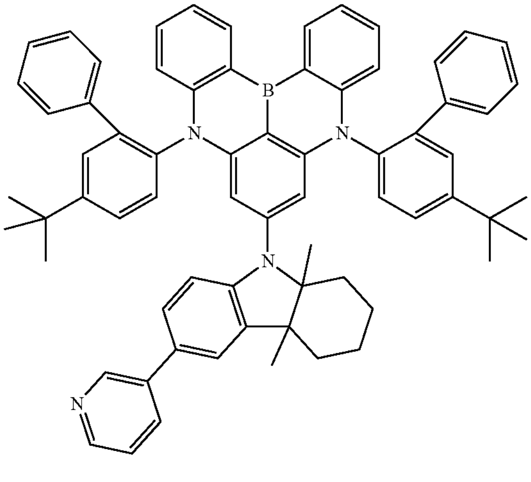

-continued
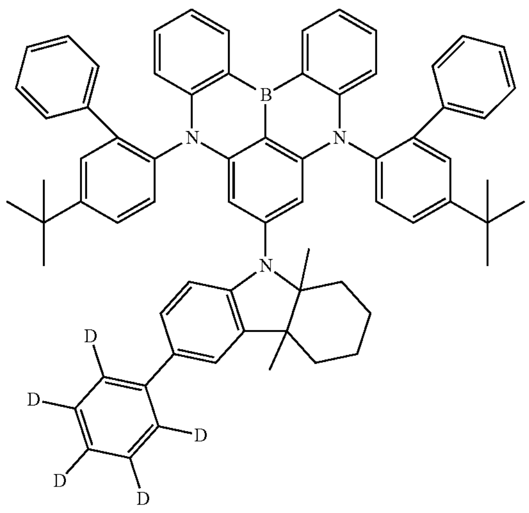
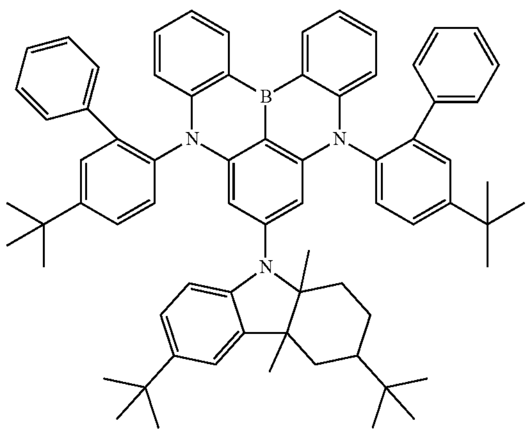
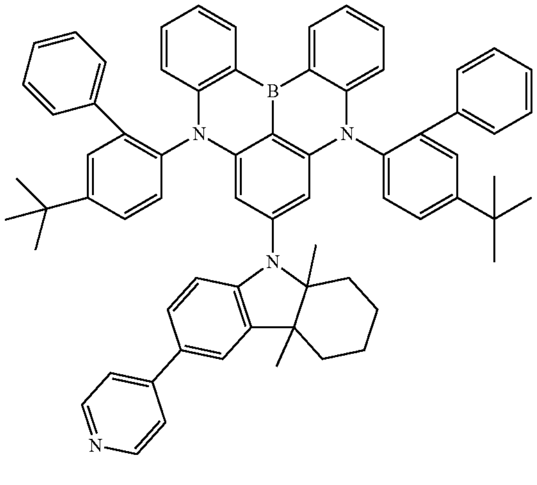
-continued
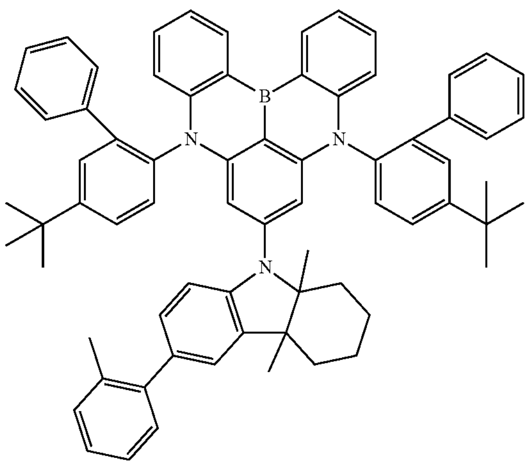
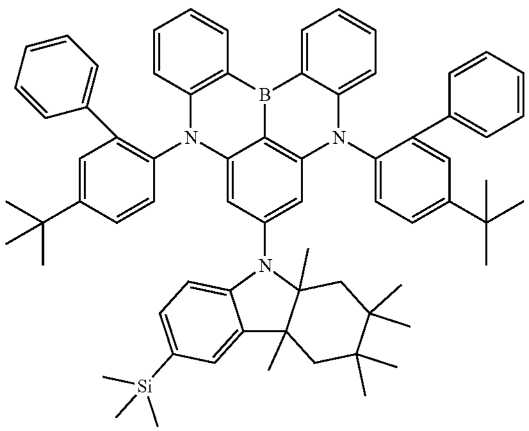
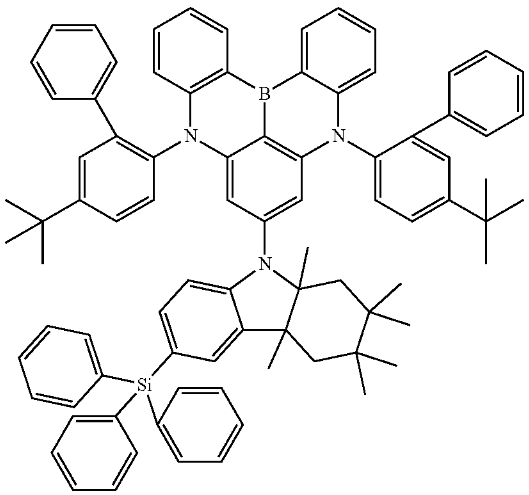

-continued
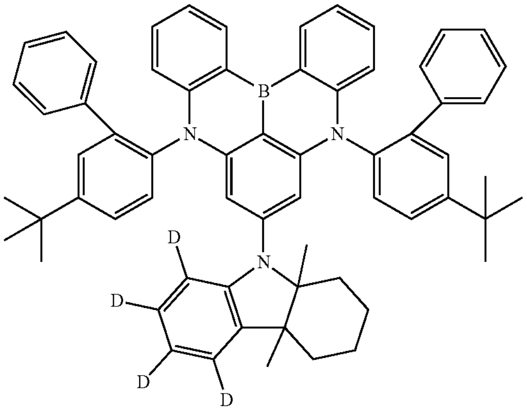
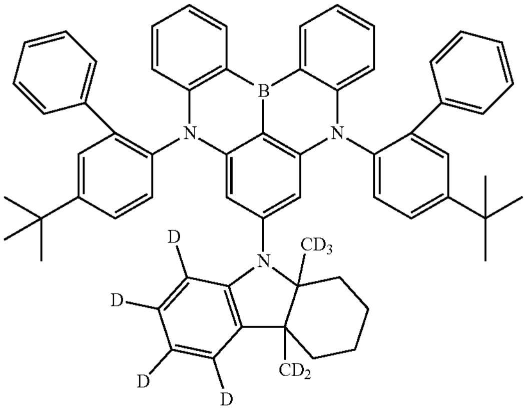
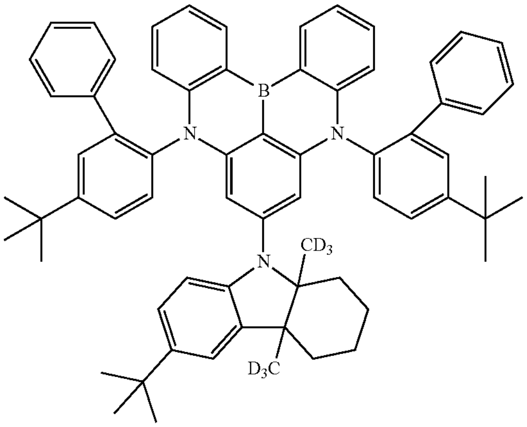
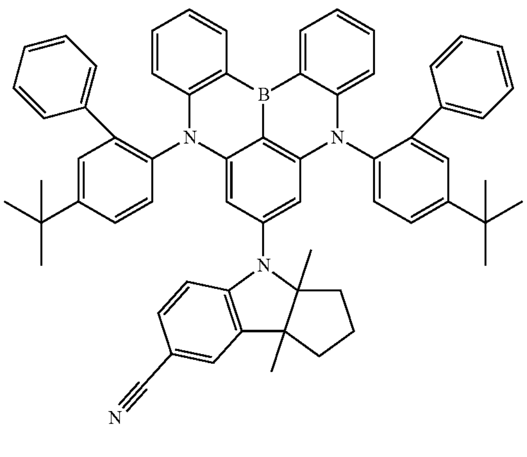
-continued
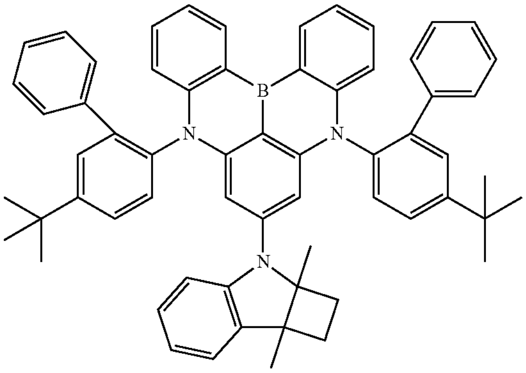
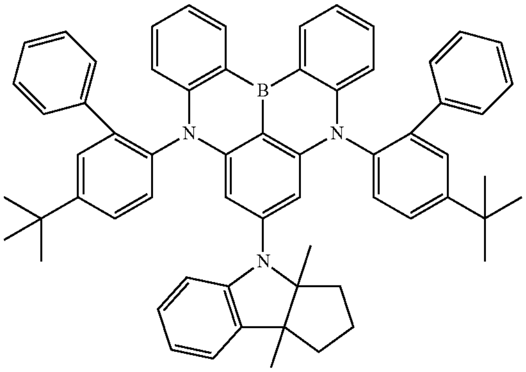
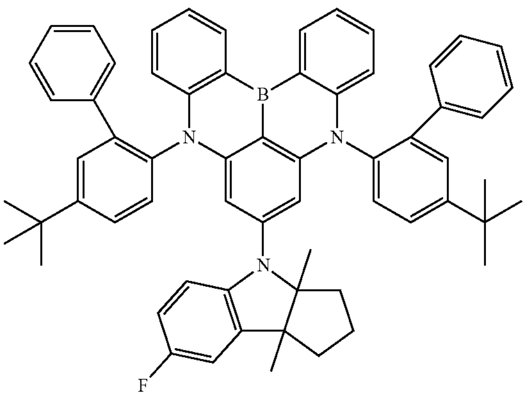
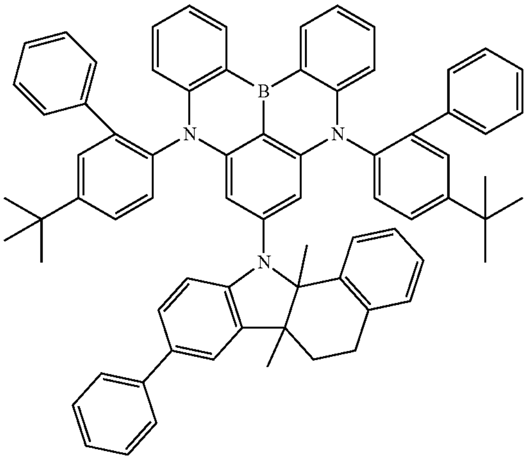

-continued
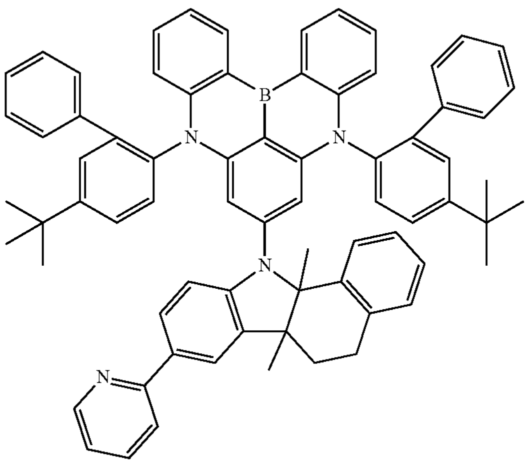
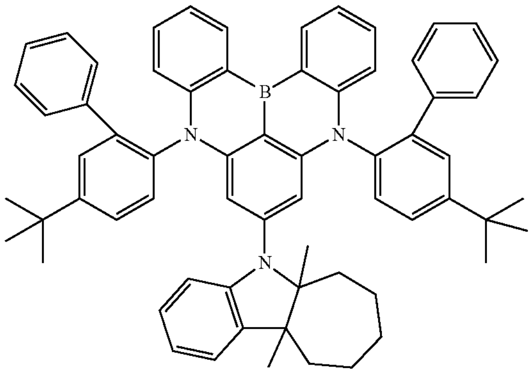
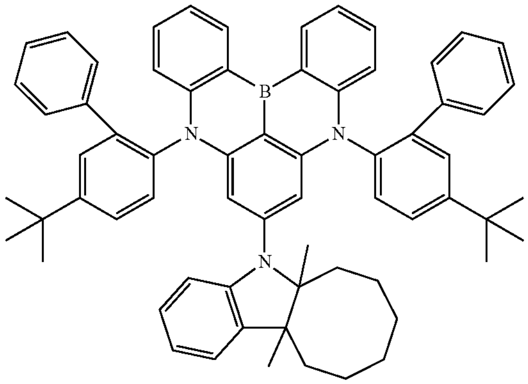
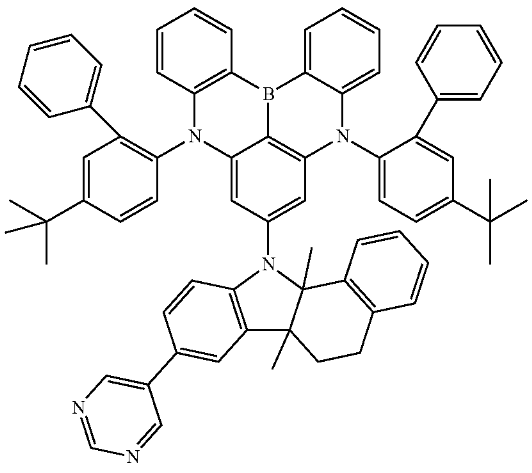
-continued
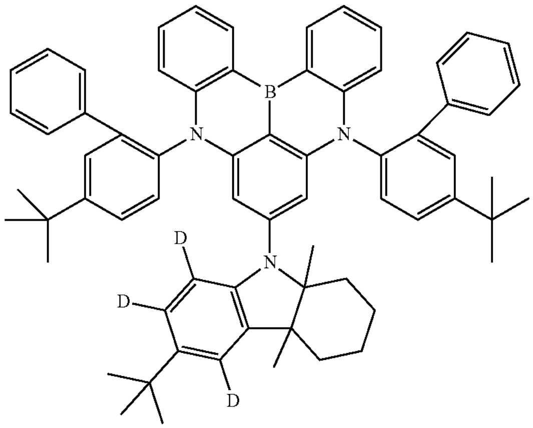
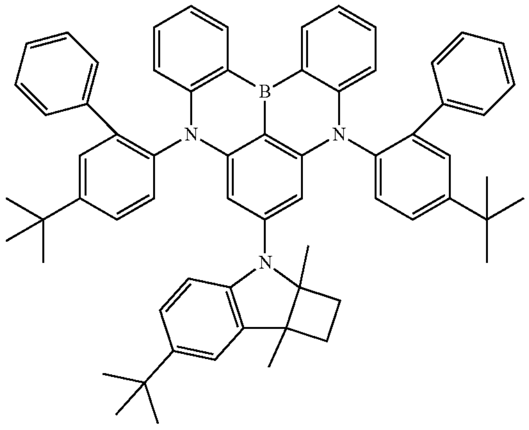
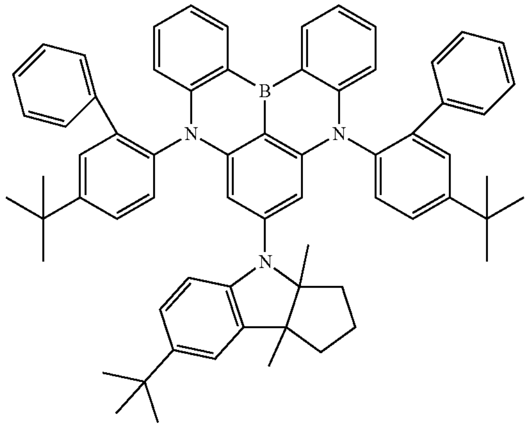
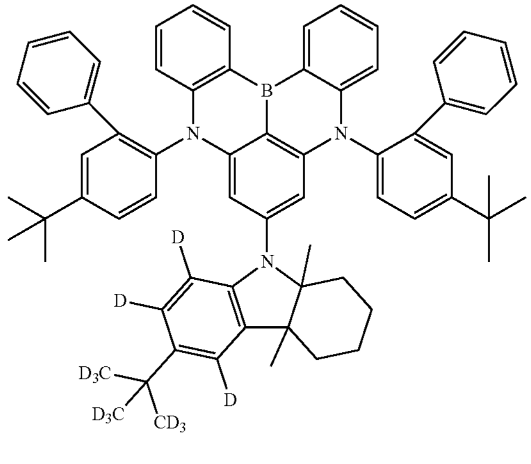

-continued
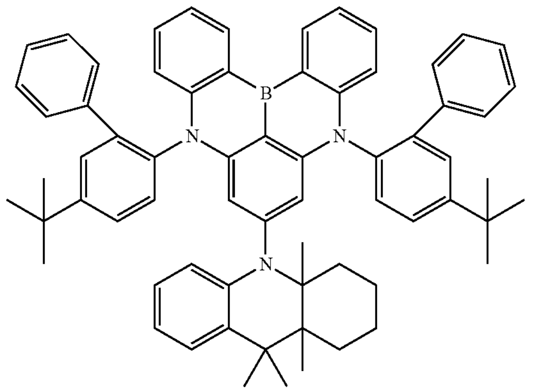
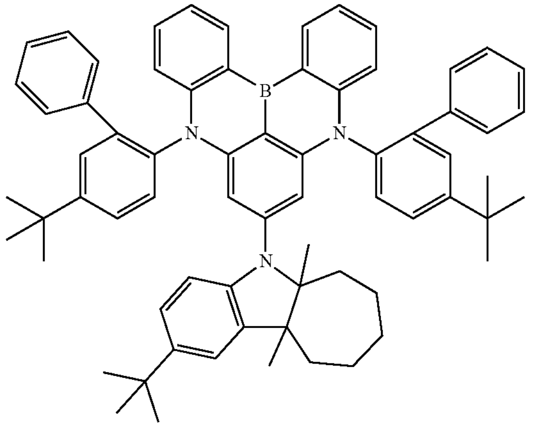
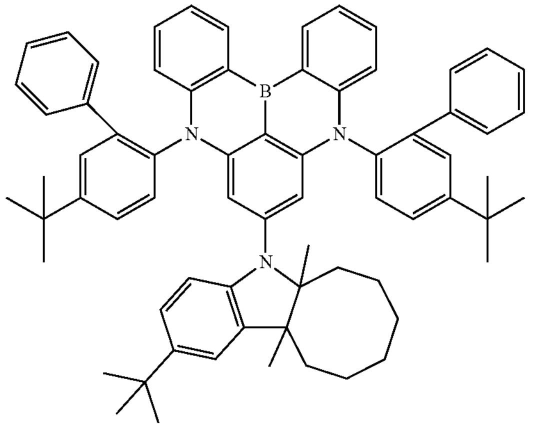
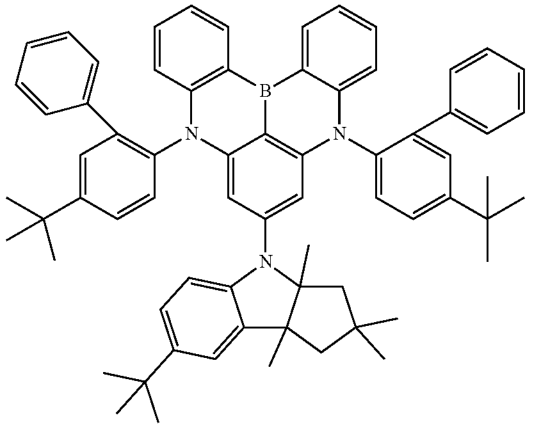
-continued
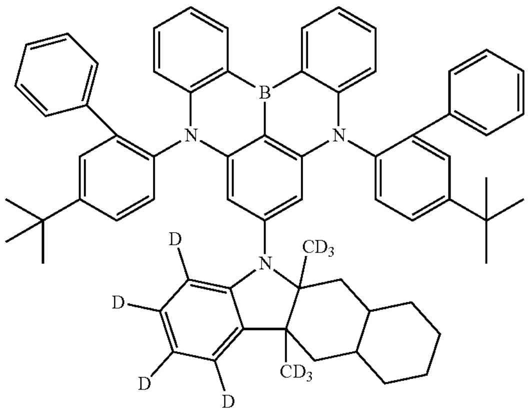
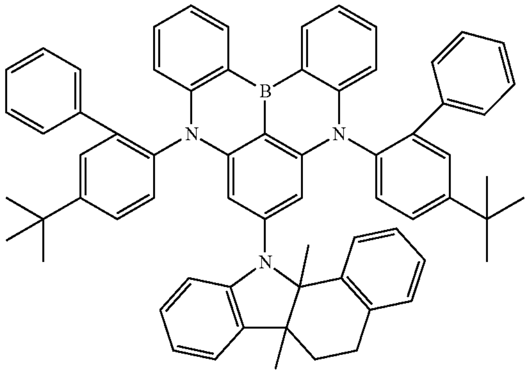
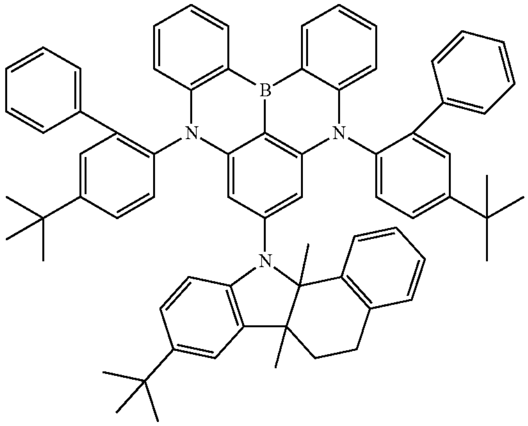
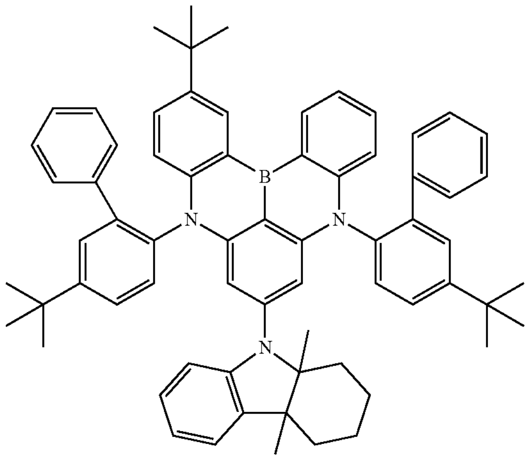

-continued
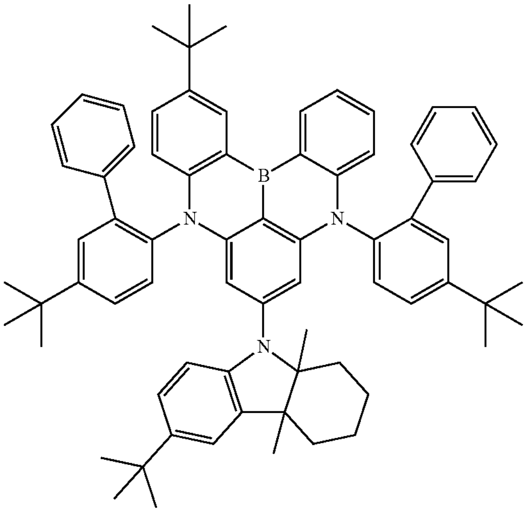
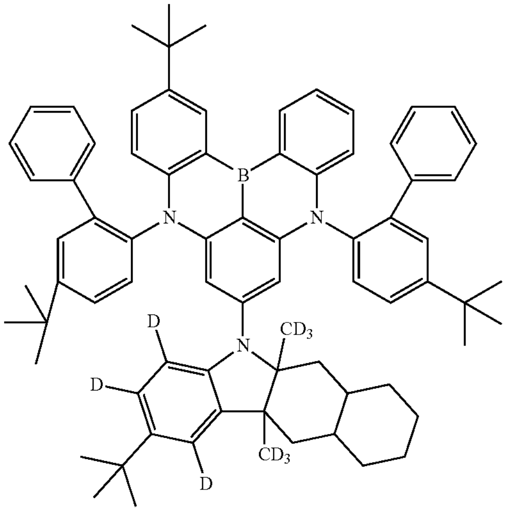
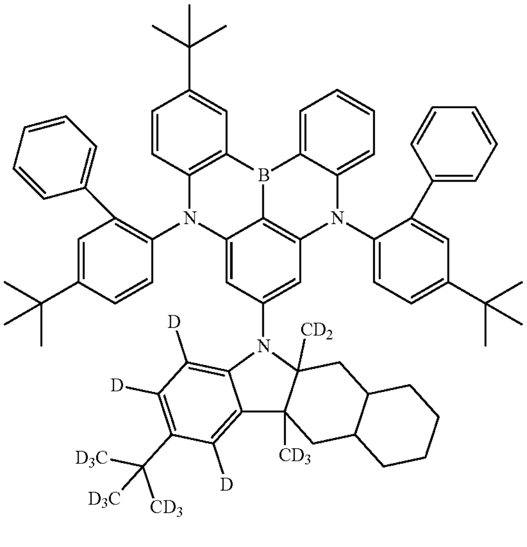
-continued
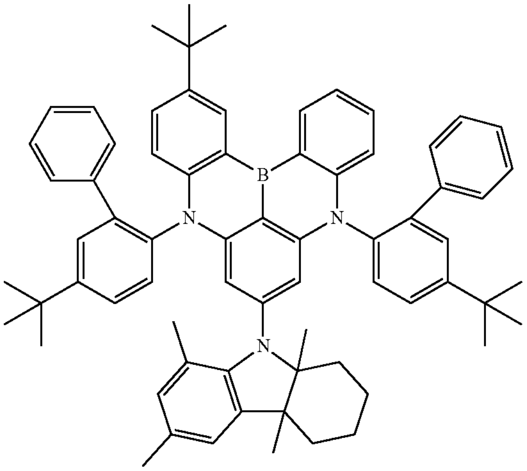
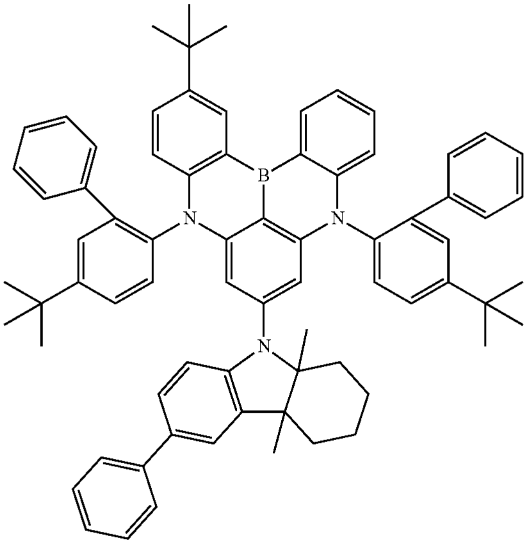
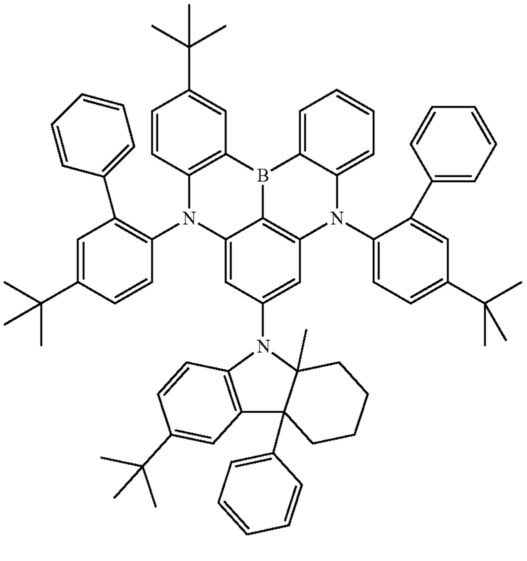

-continued
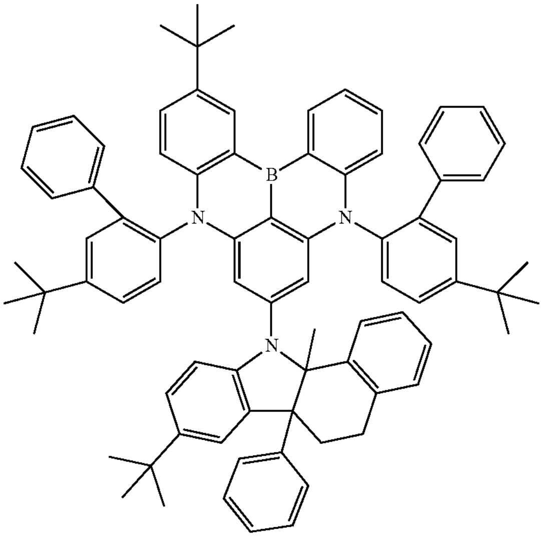
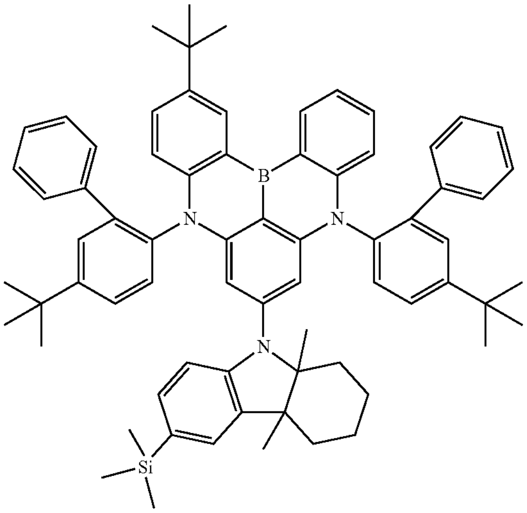
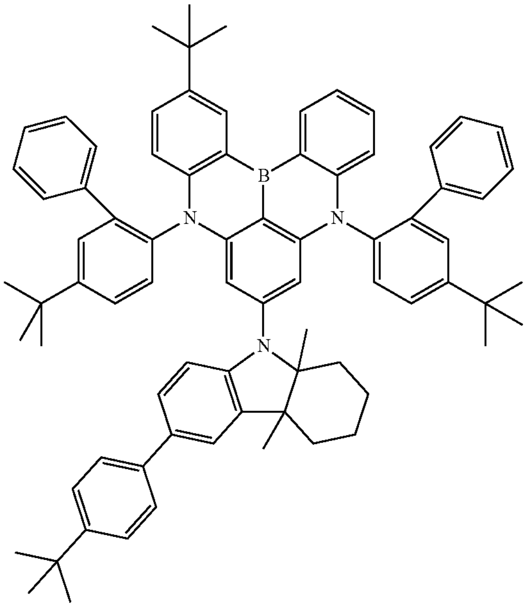
-continued
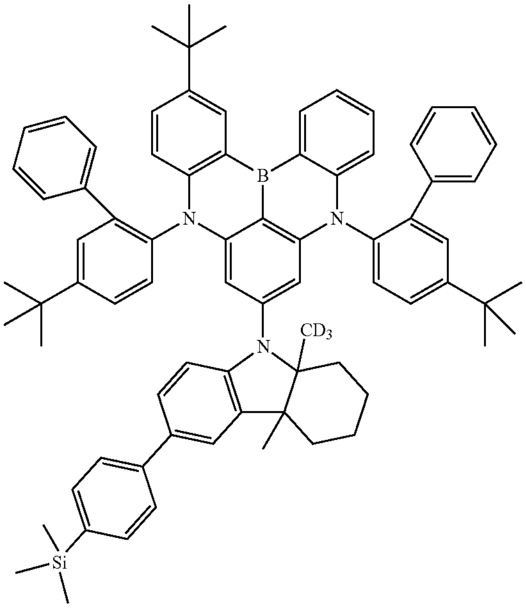
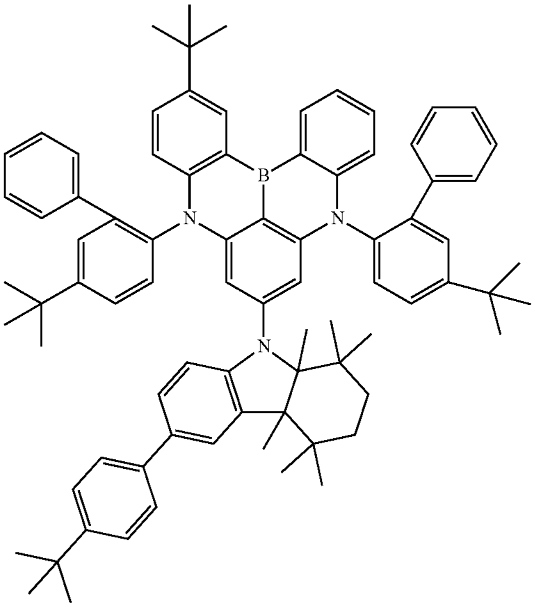

-continued
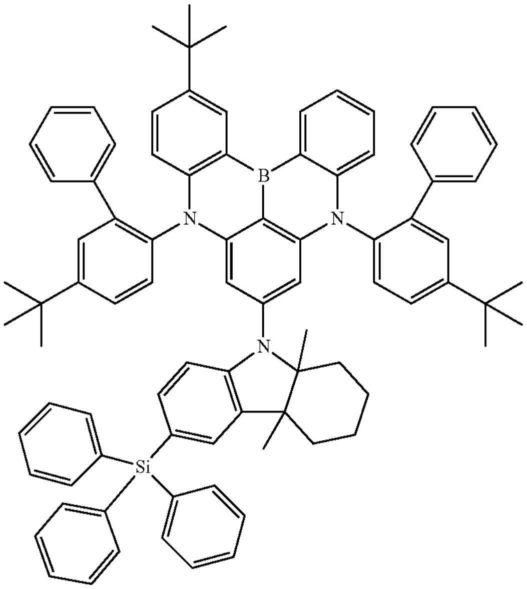
-continued
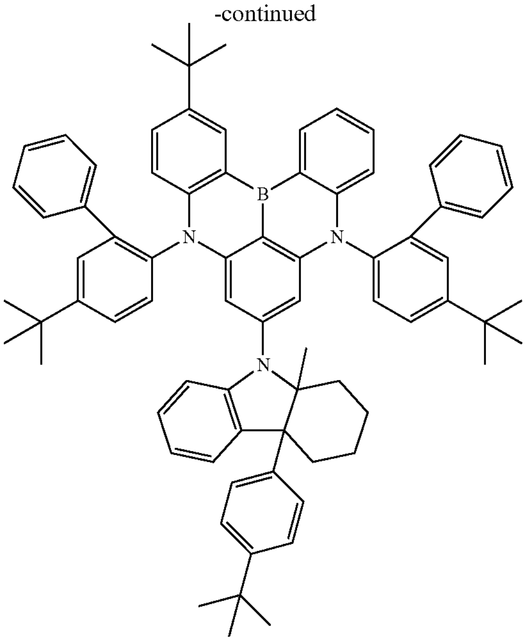
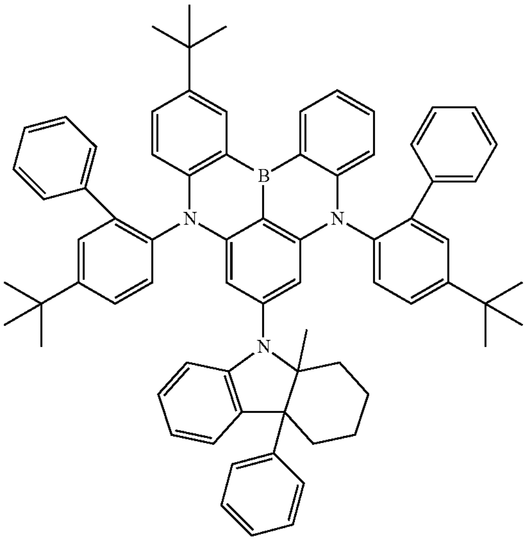
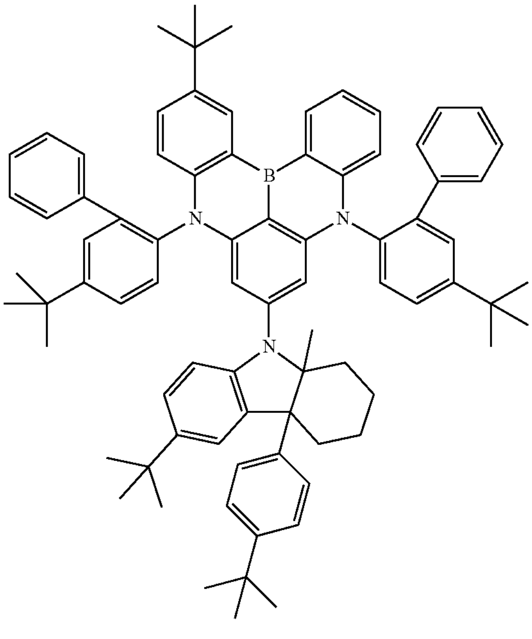

-continued
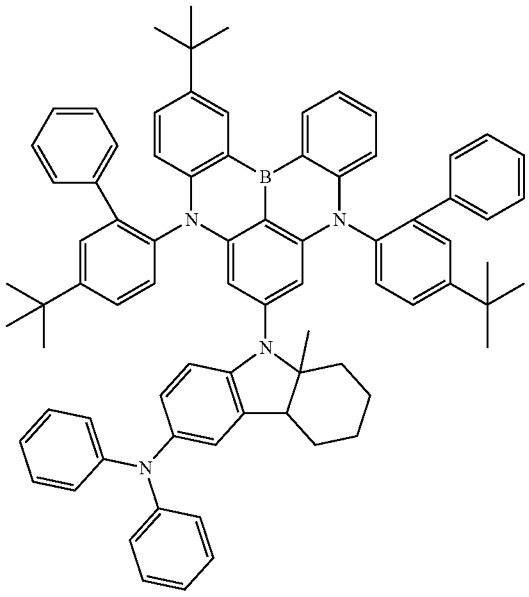
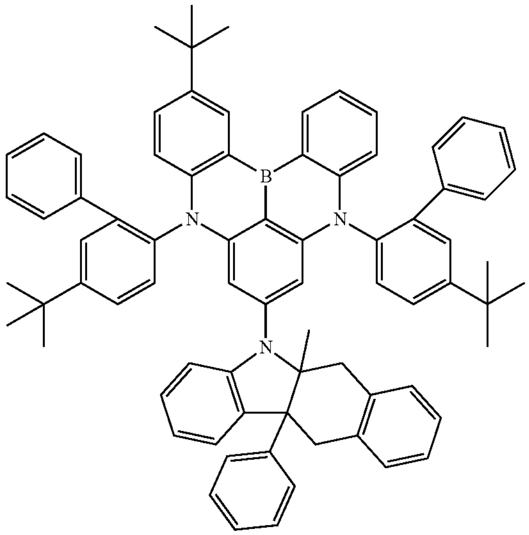
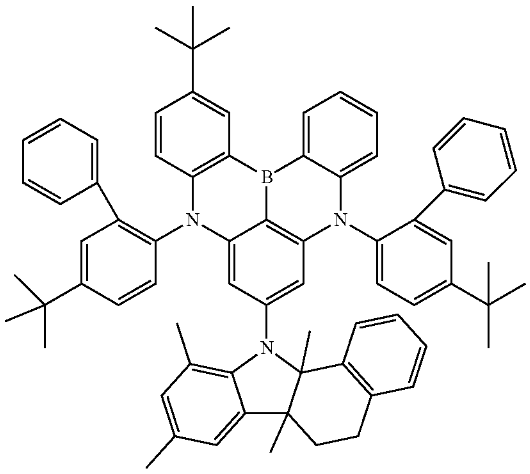
-continued
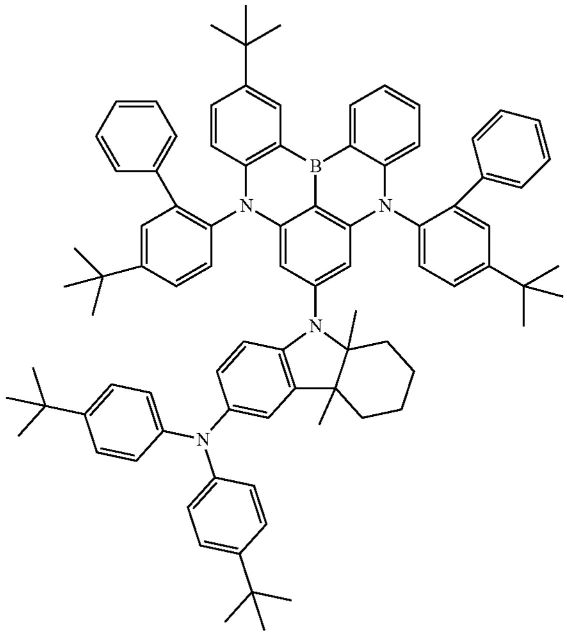
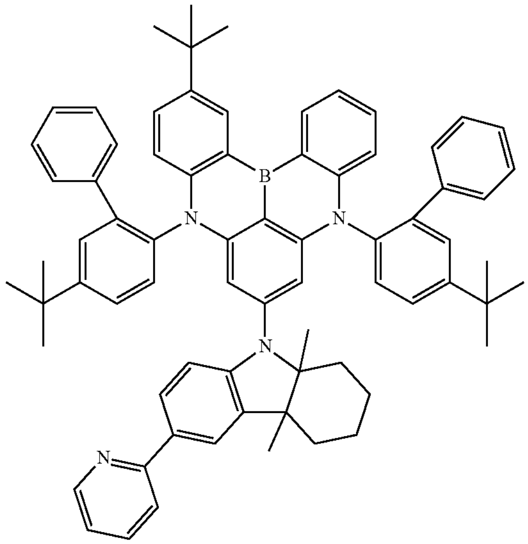
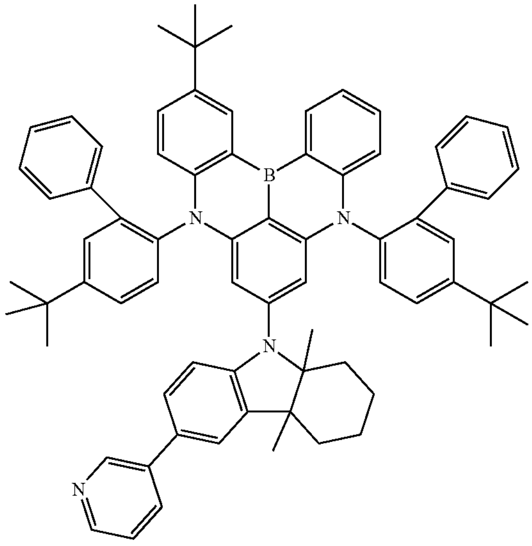

-continued
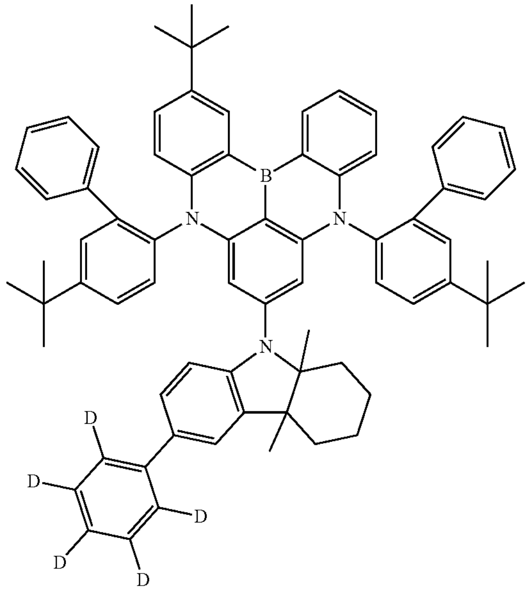
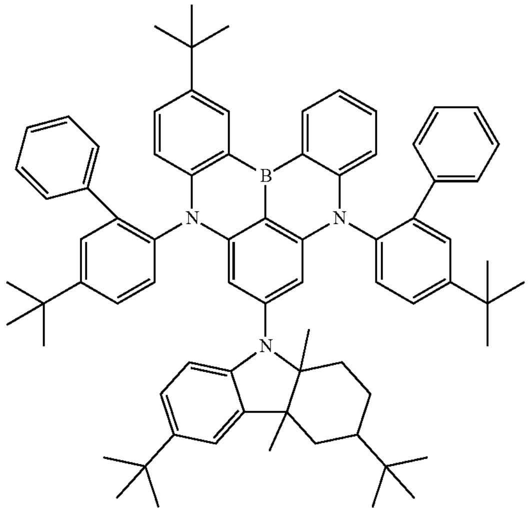
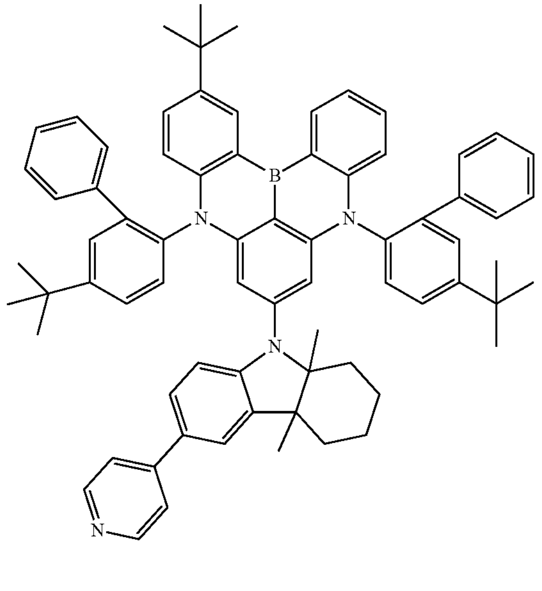
-continued
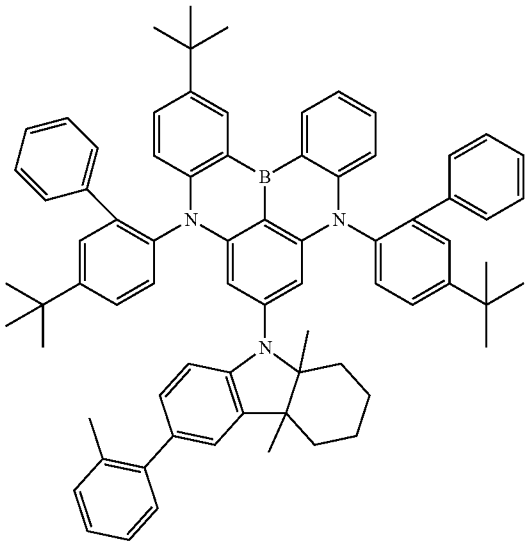
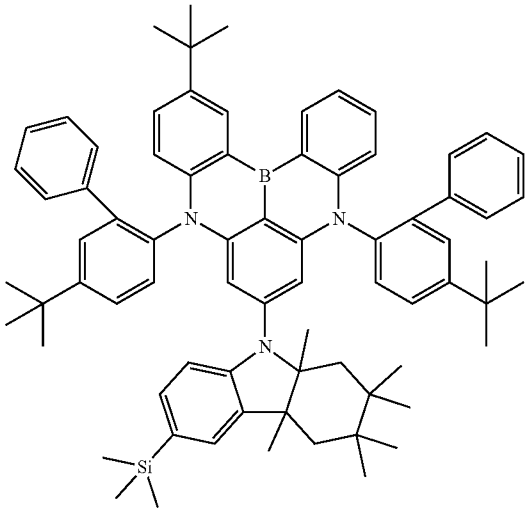
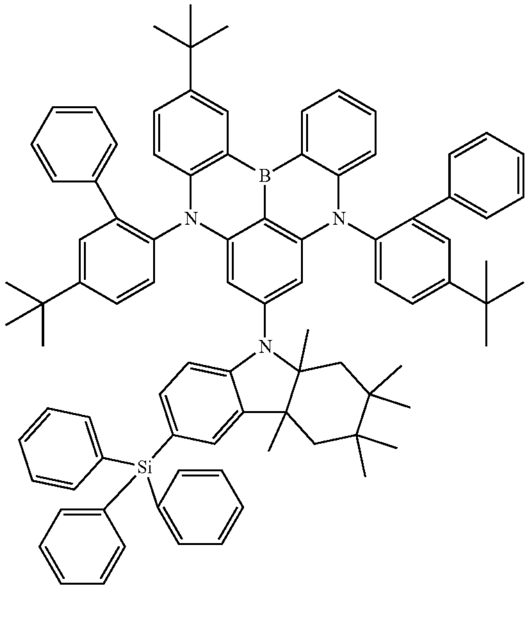

-continued
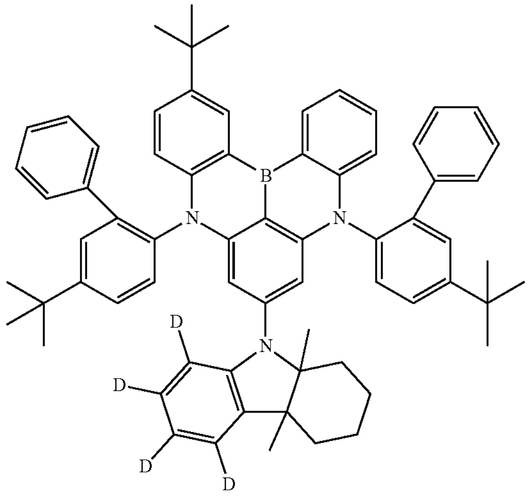
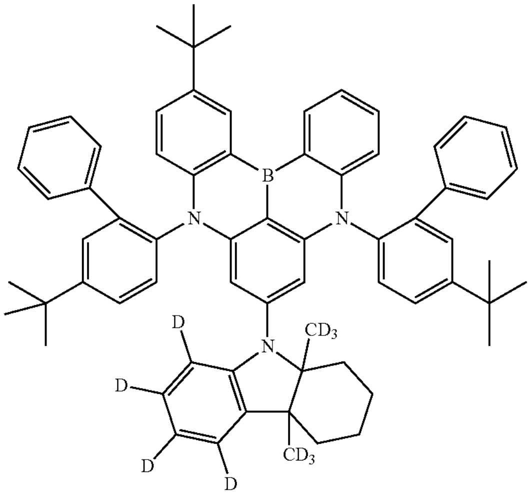
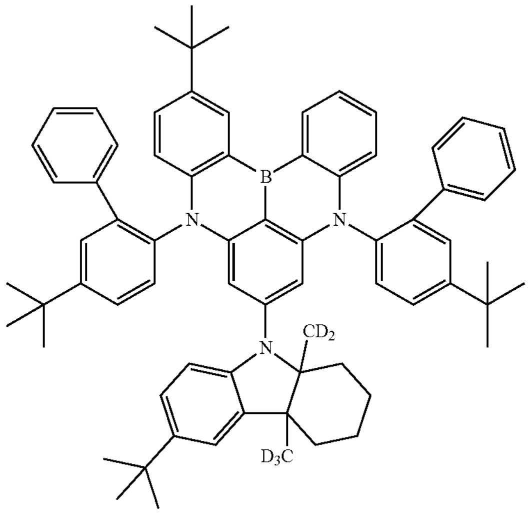
-continued
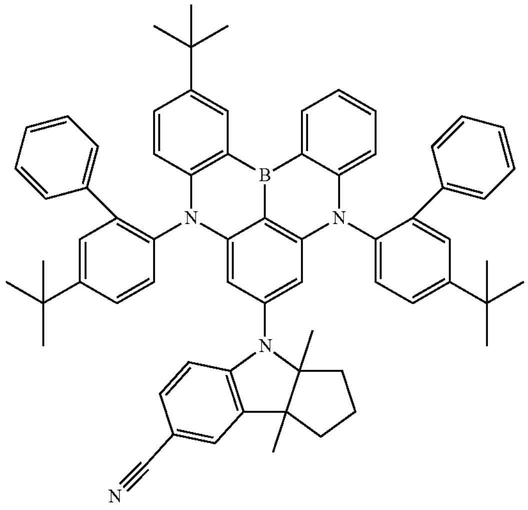
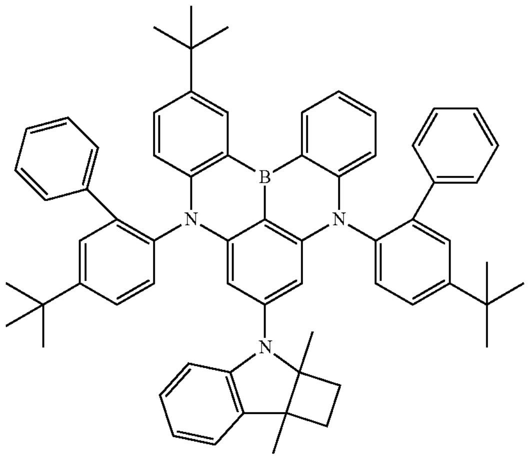
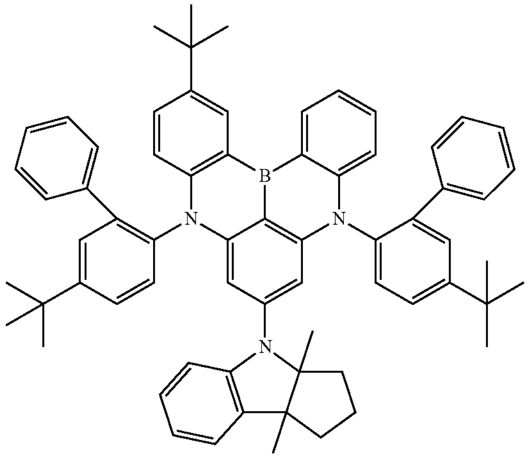

-continued
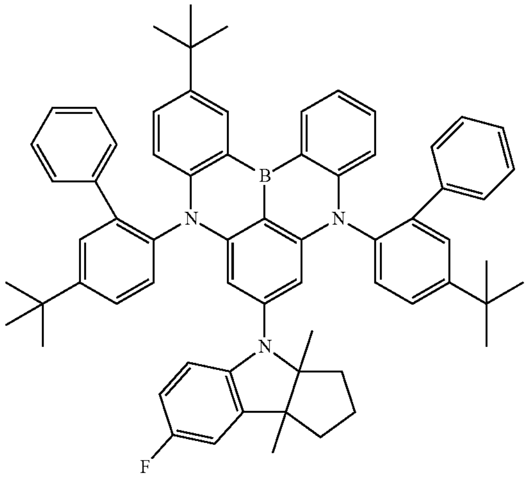
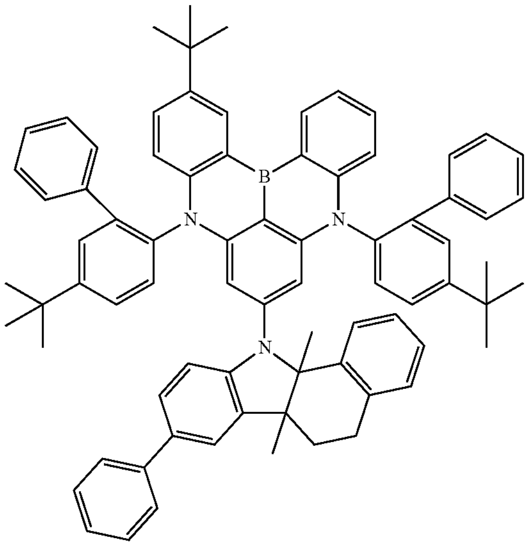
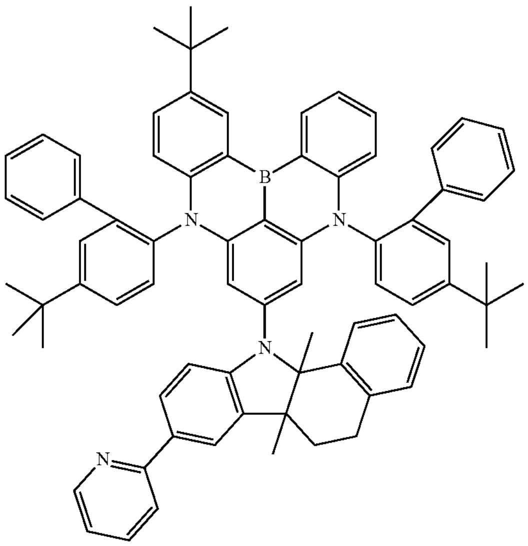
-continued
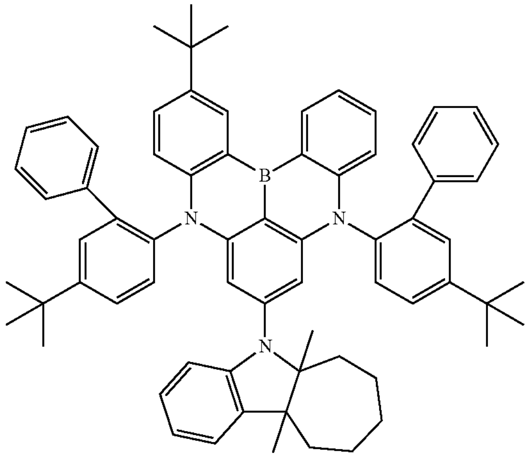
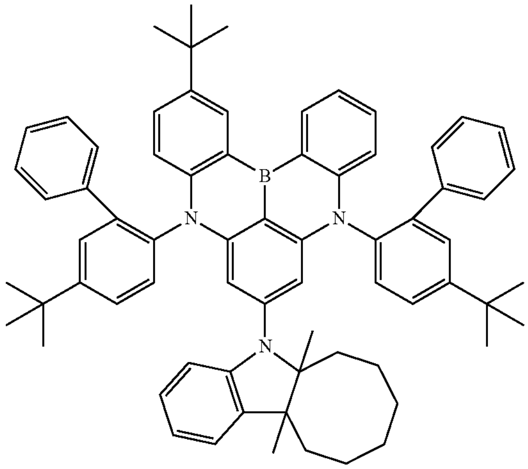
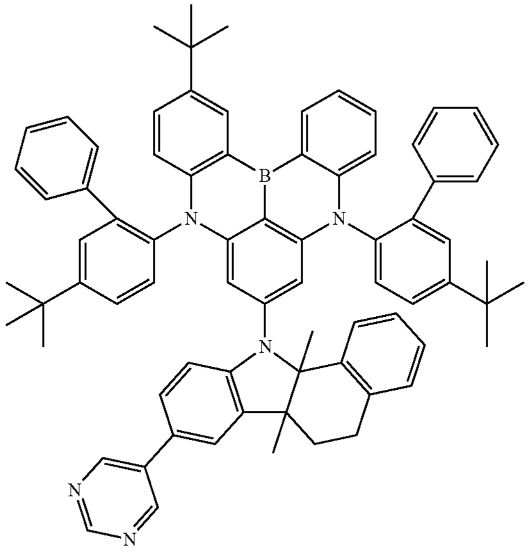

-continued
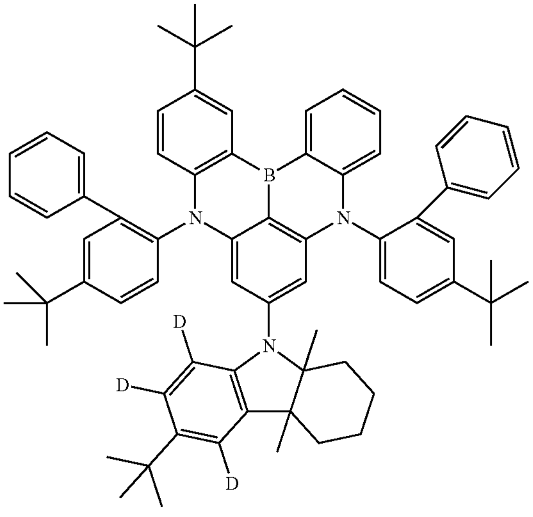
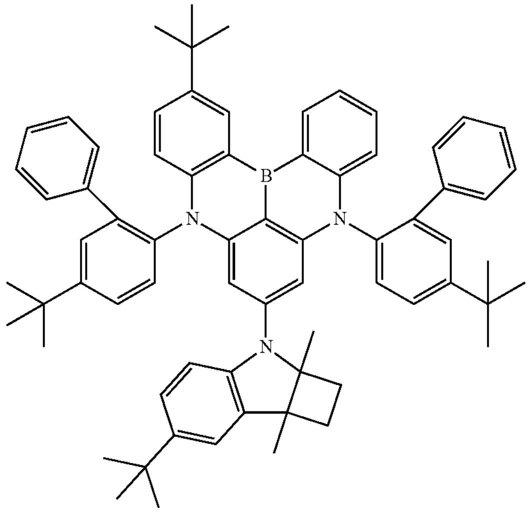
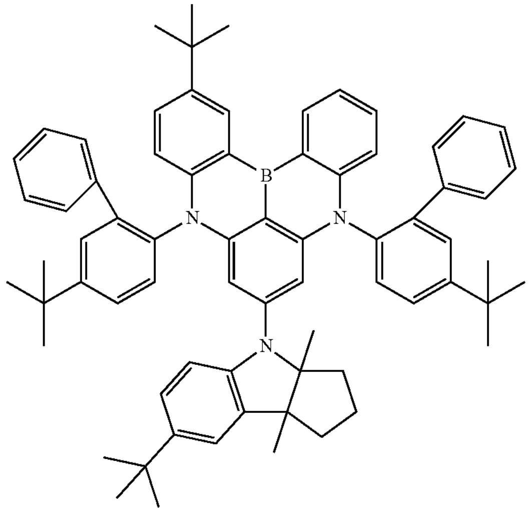
-continued
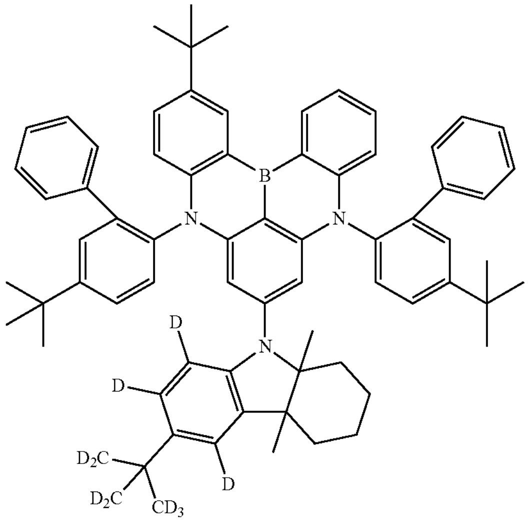
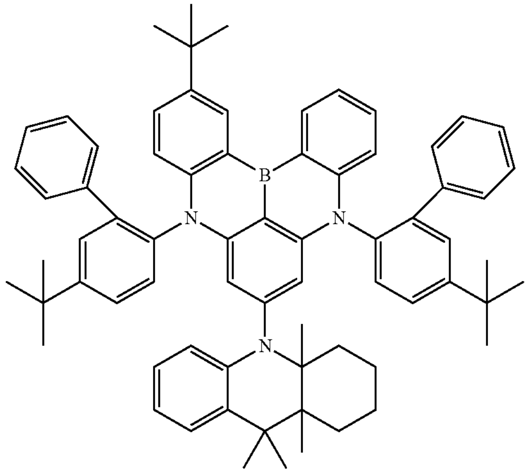
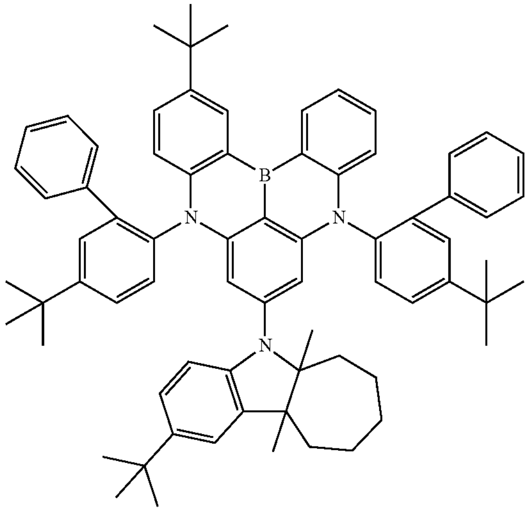

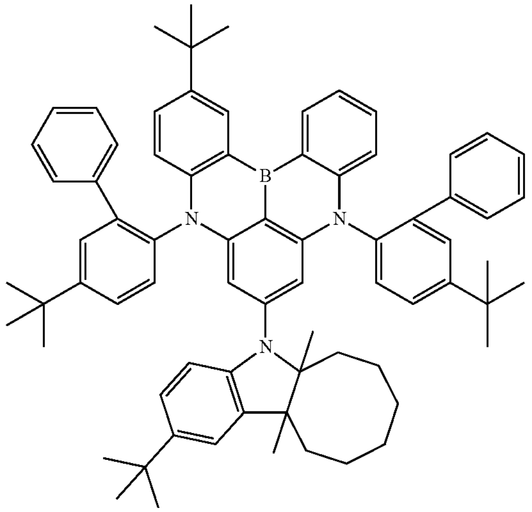
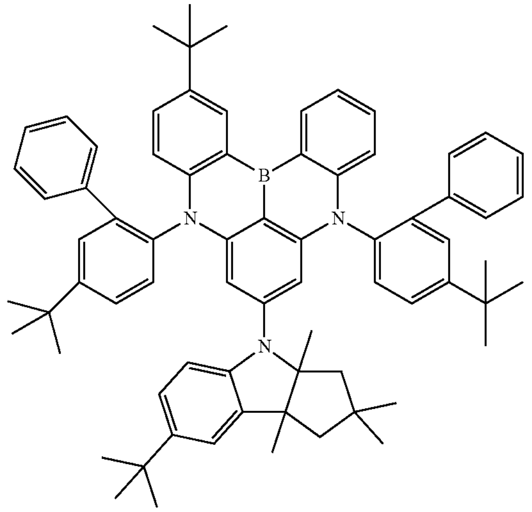
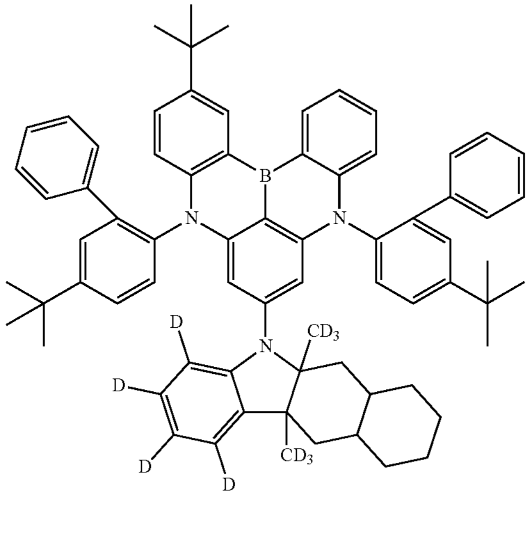
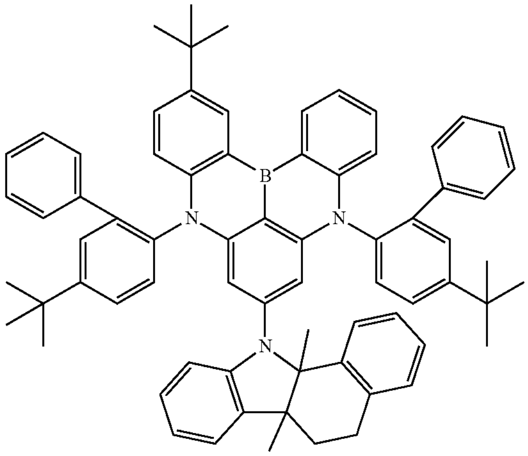
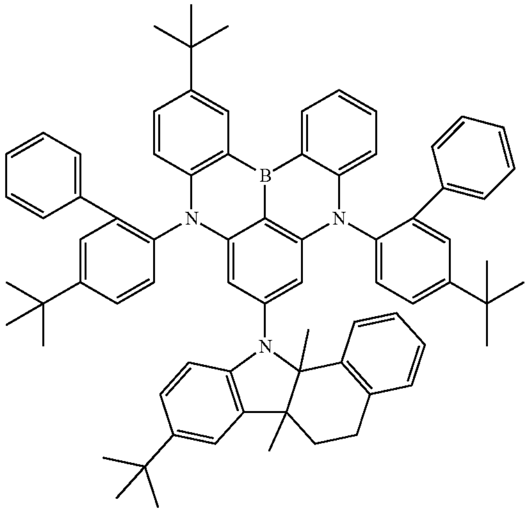
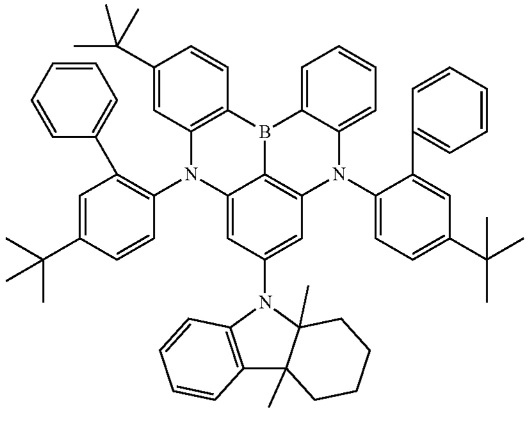

-continued
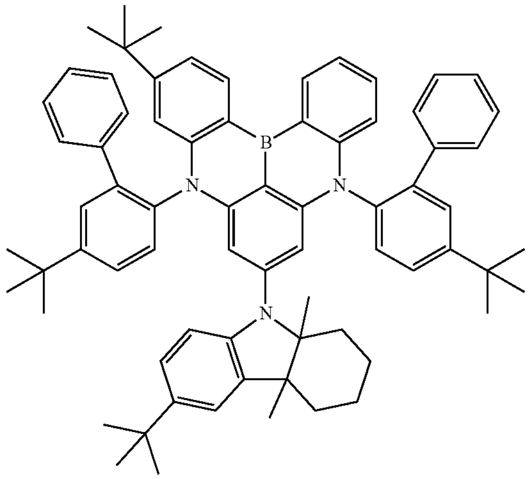
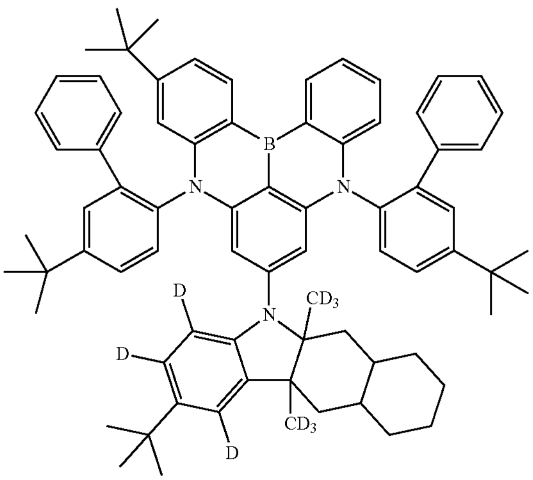
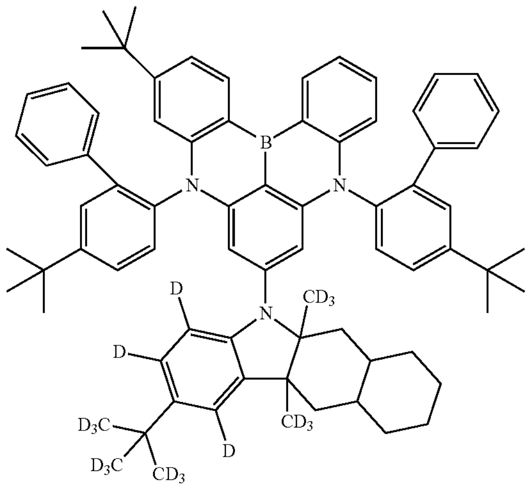
-continued
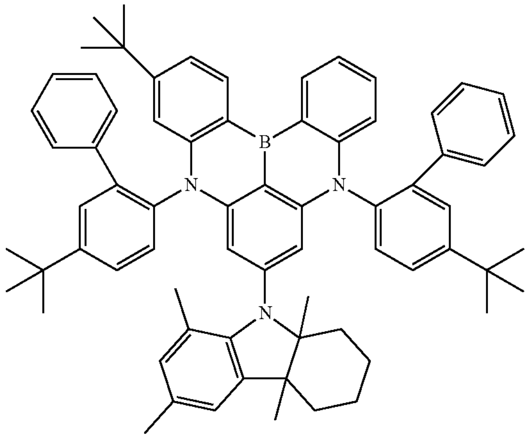
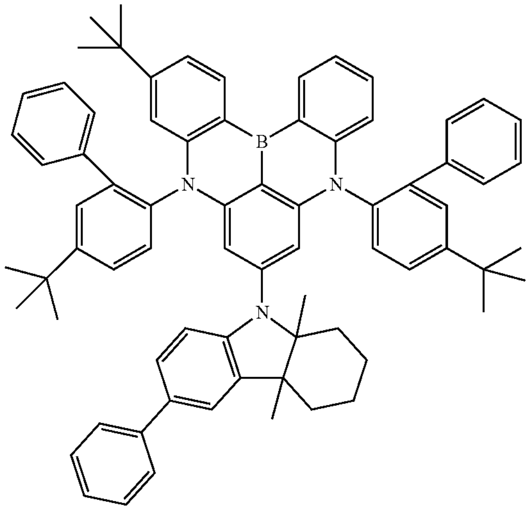
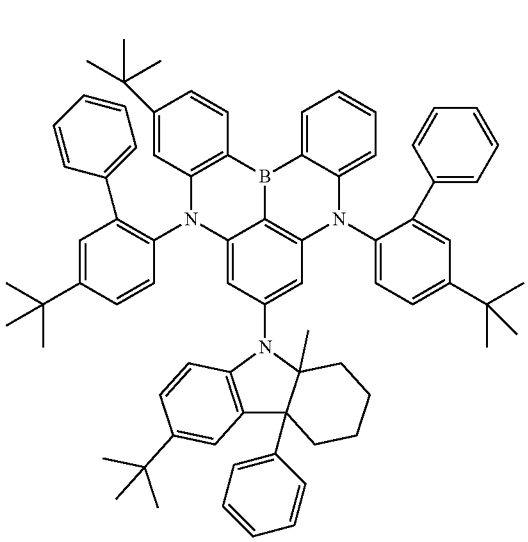

-continued
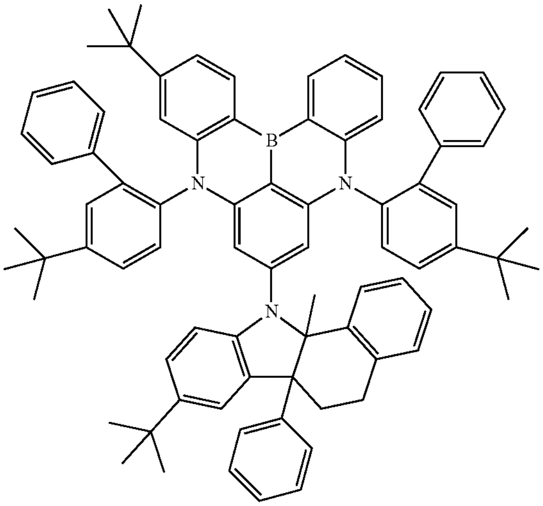
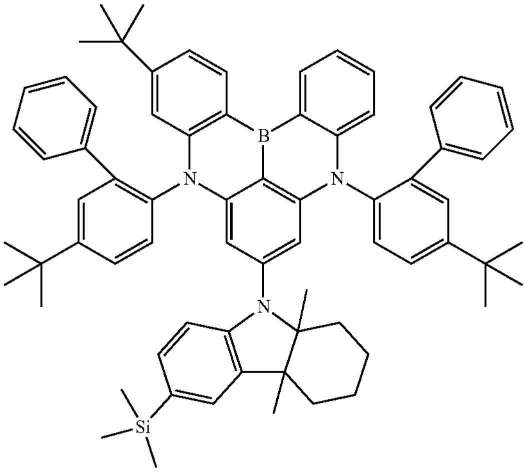
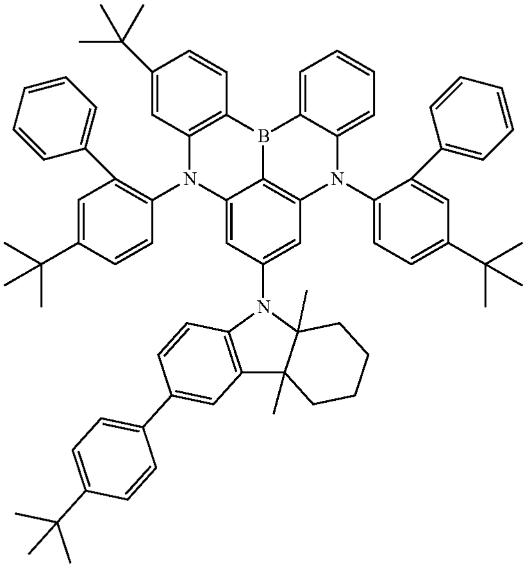
-continued
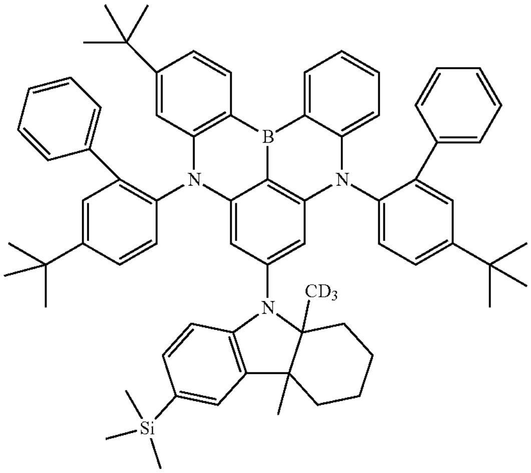
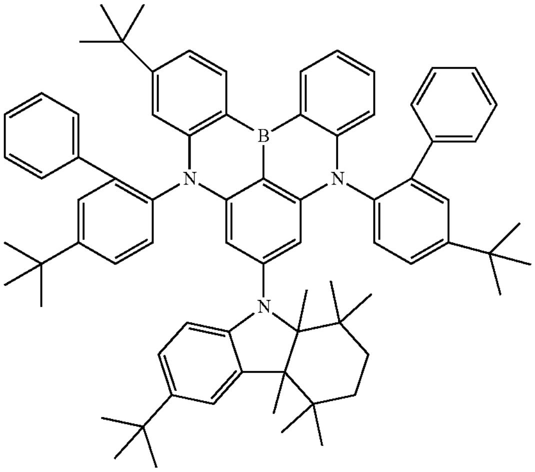
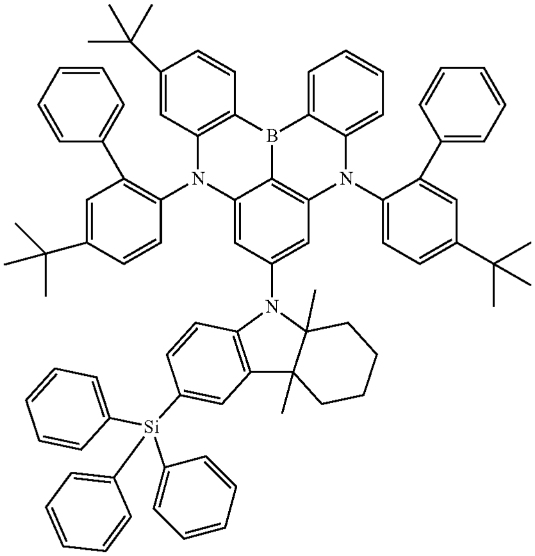

-continued
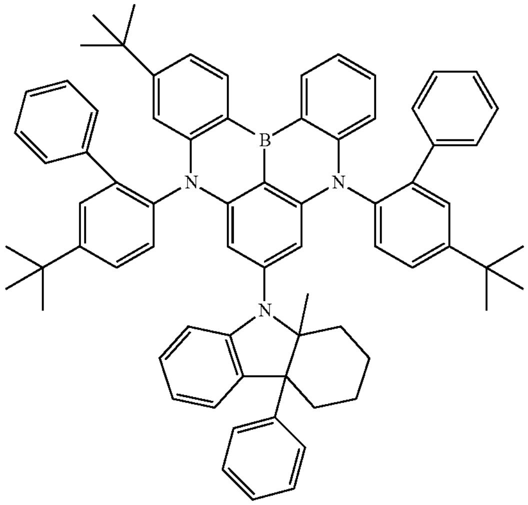
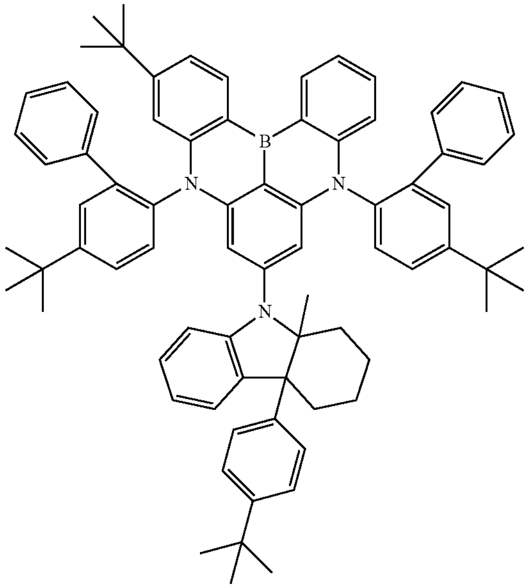
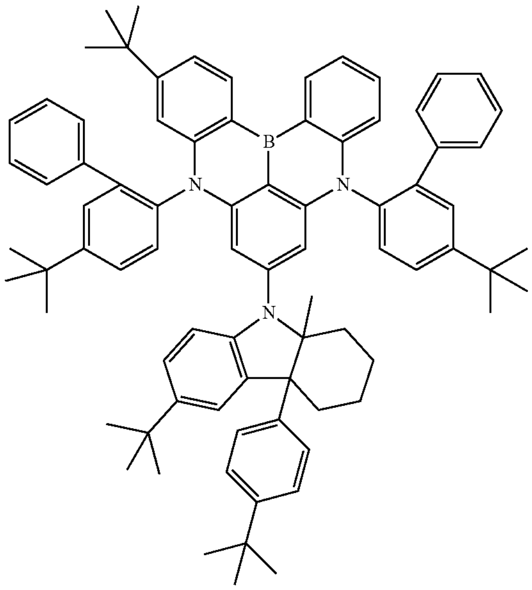 [SMILES: CC(C)(C)c1ccc(C23CCCCC2(C)N(c2cc4c5c(c2)N(c2ccc(C(C)(C)C)cc2-c2ccccc2)c2cc(C(C)(C)C)ccc2B5c2ccccc2N4c2ccc(C(C)(C)C)cc2-c2ccccc2)c2ccc(C(C)(C)C)cc23)cc1]
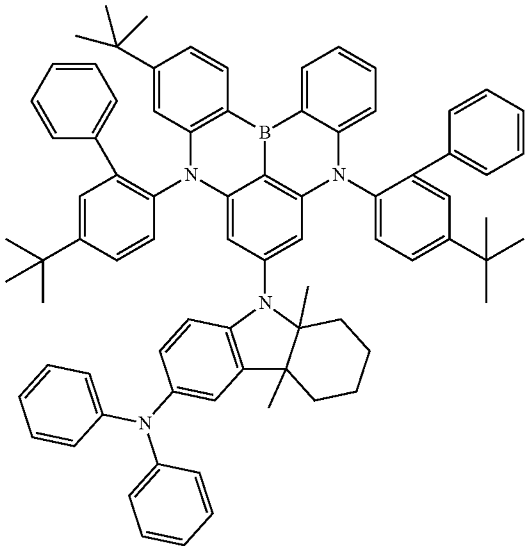
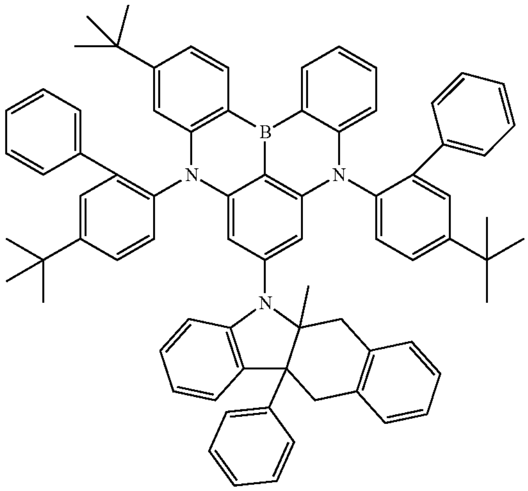
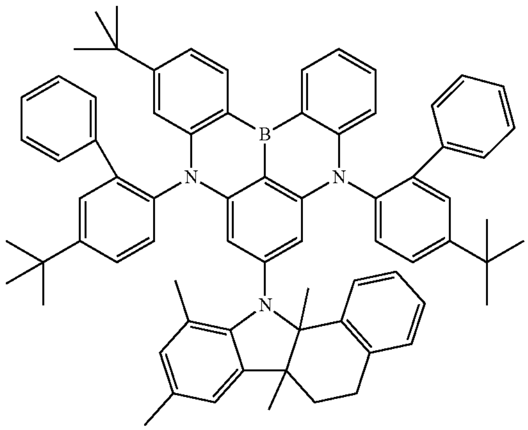

-continued
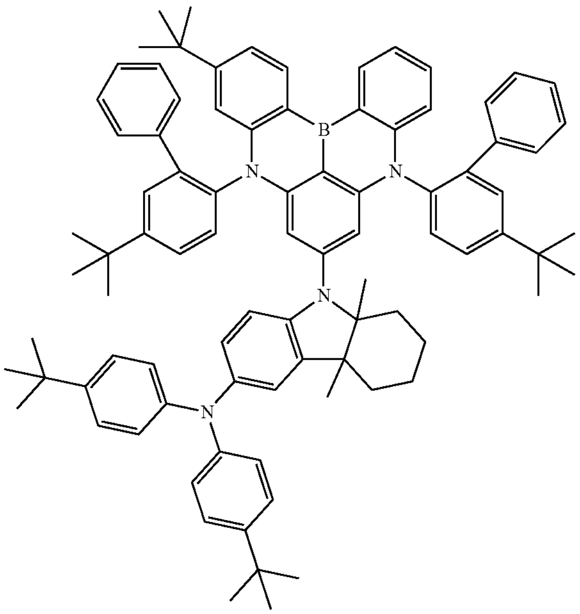
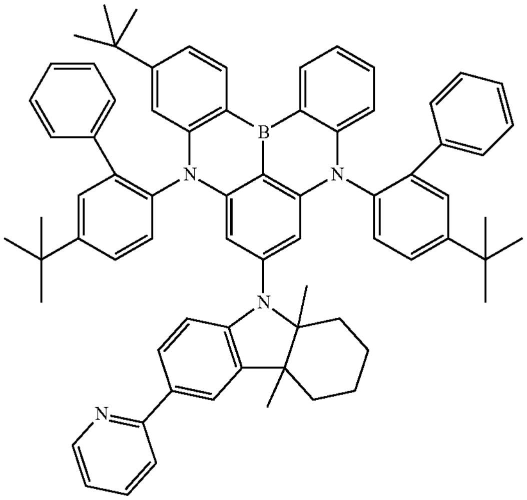
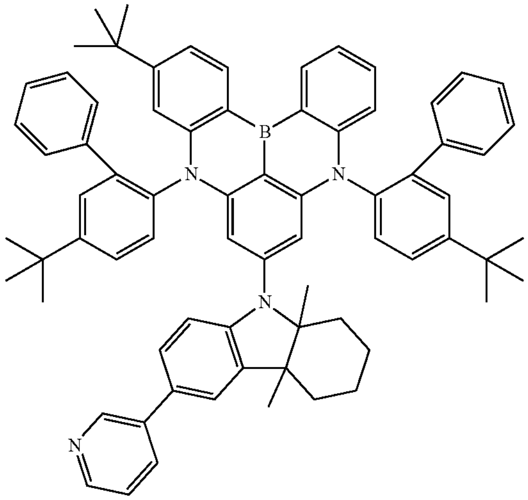
-continued
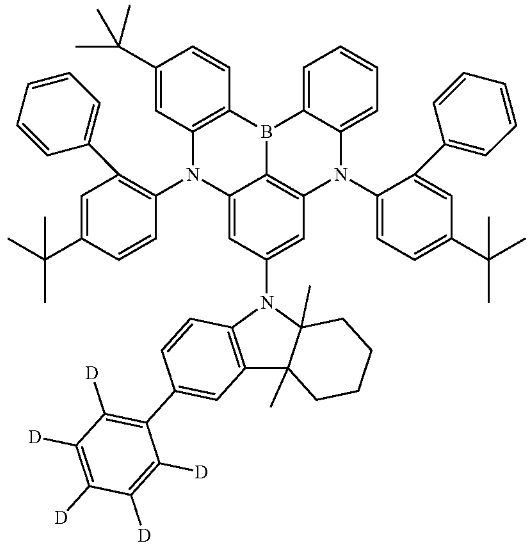
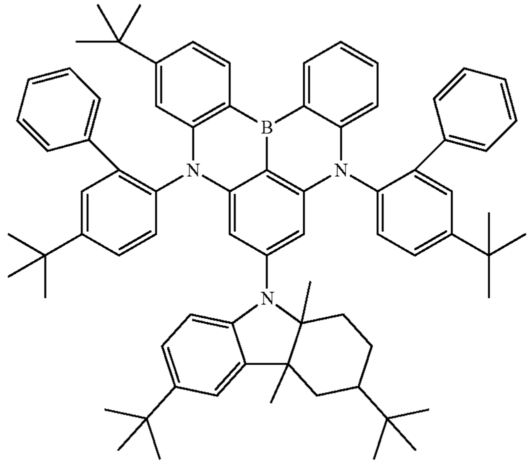
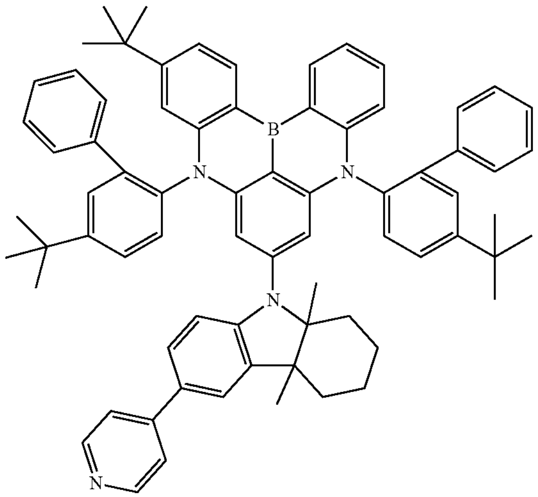

-continued
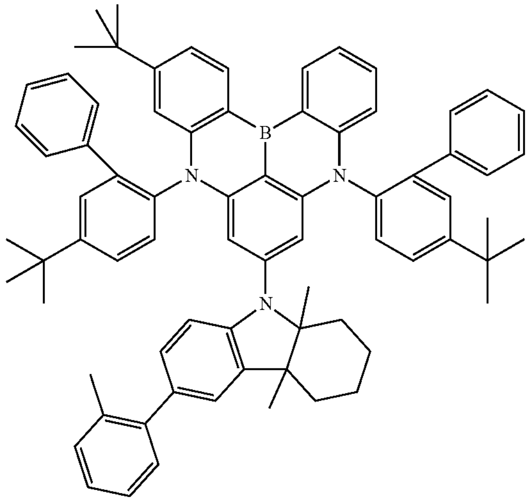
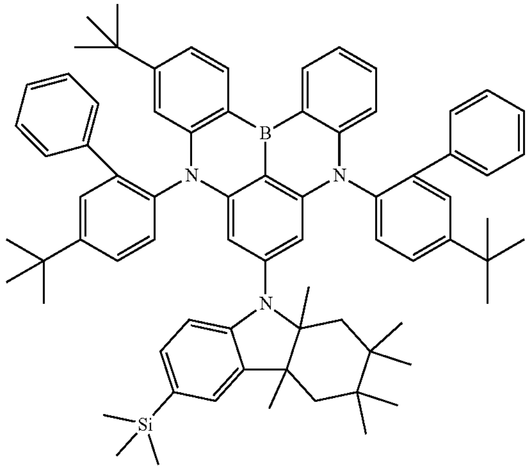
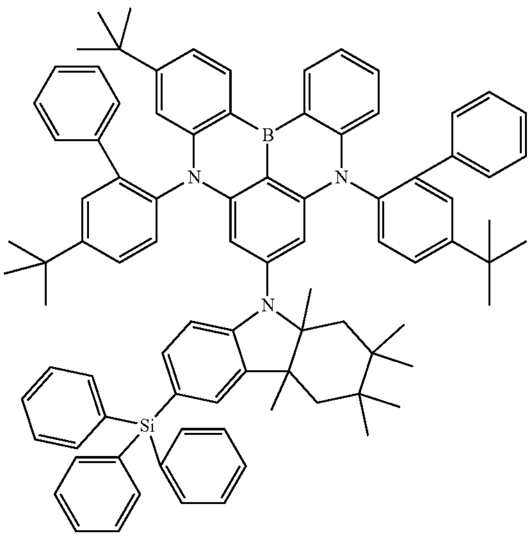
-continued
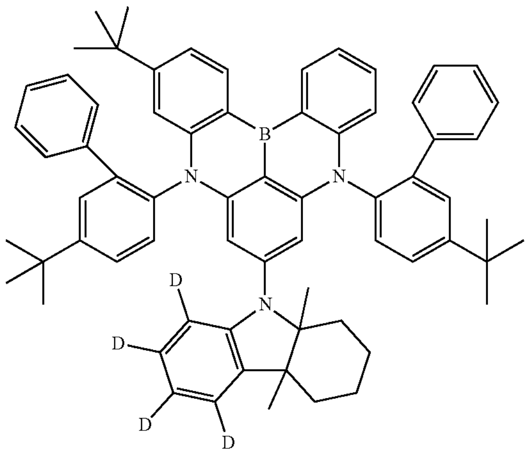
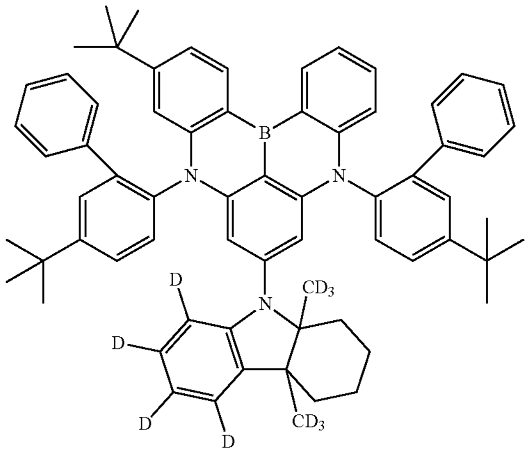
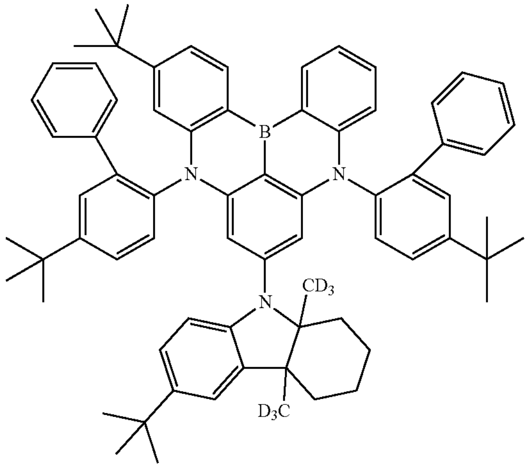

-continued
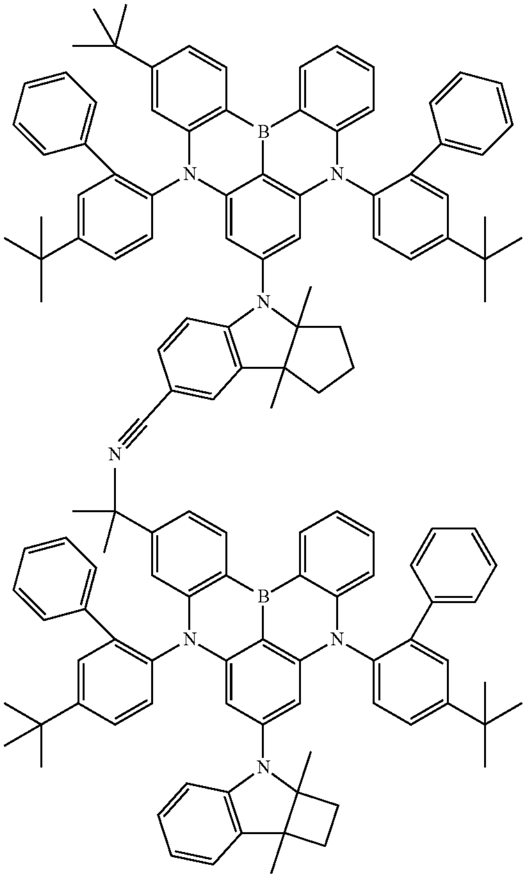
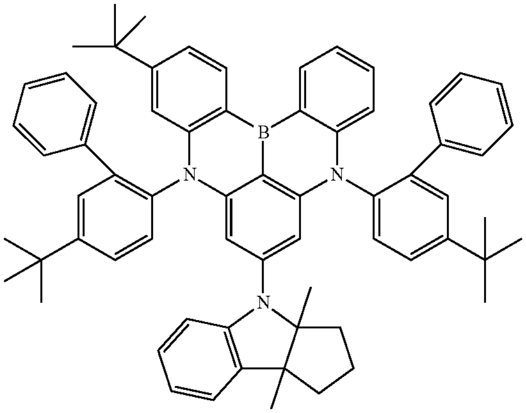
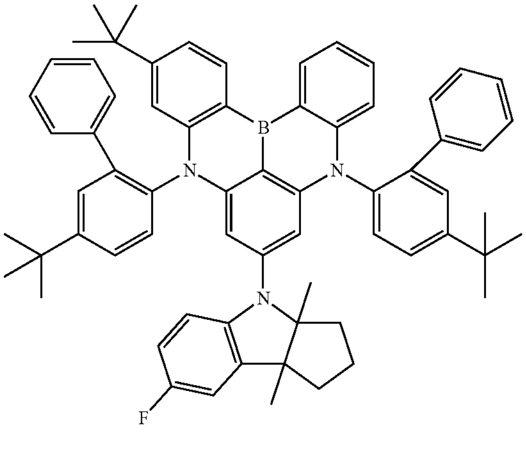
-continued
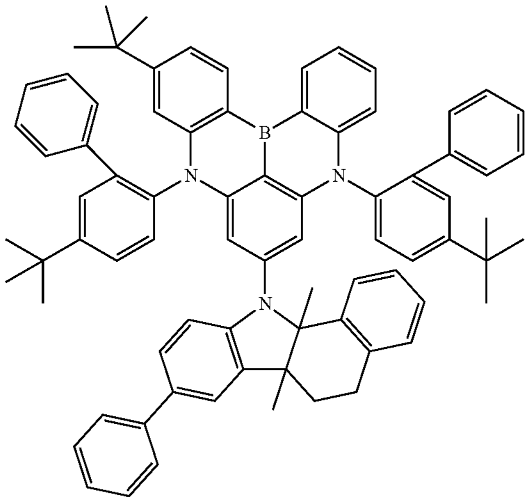
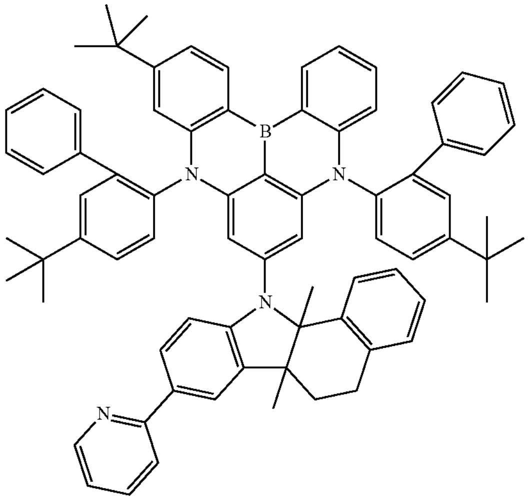
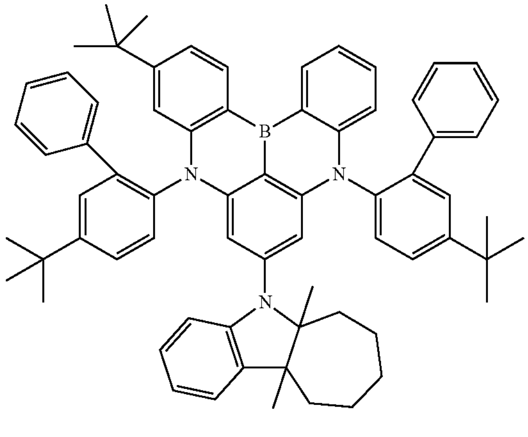

-continued
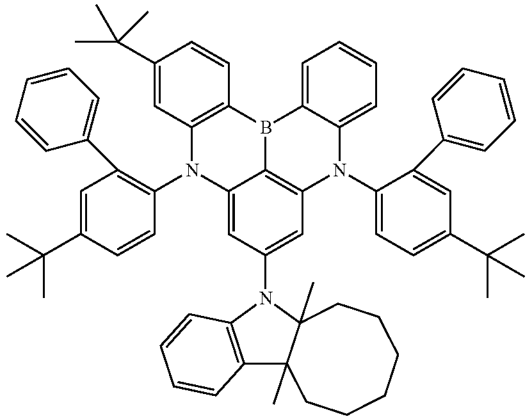
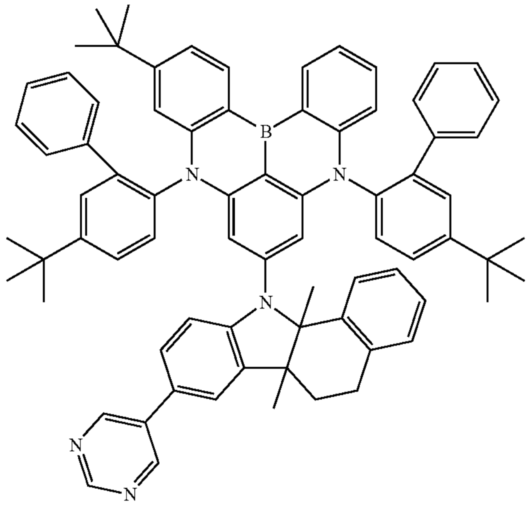
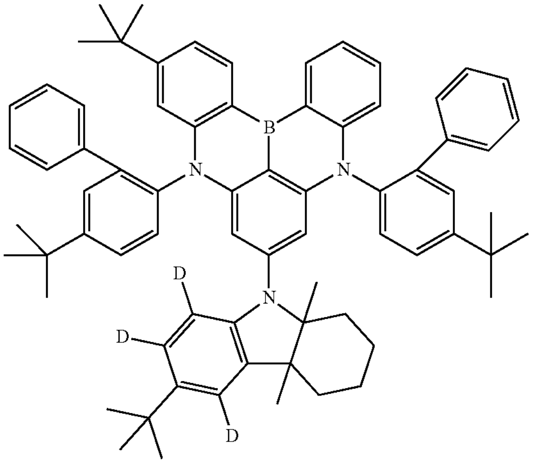
-continued
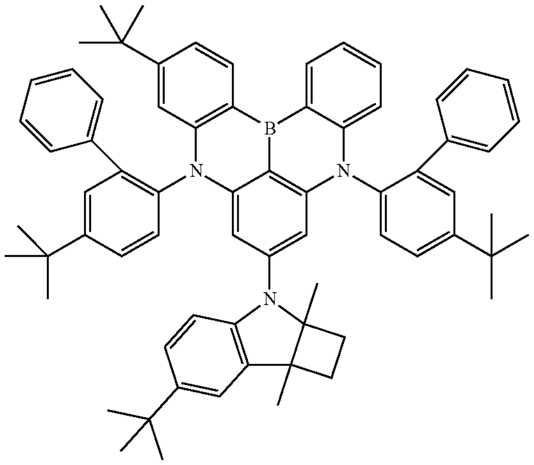
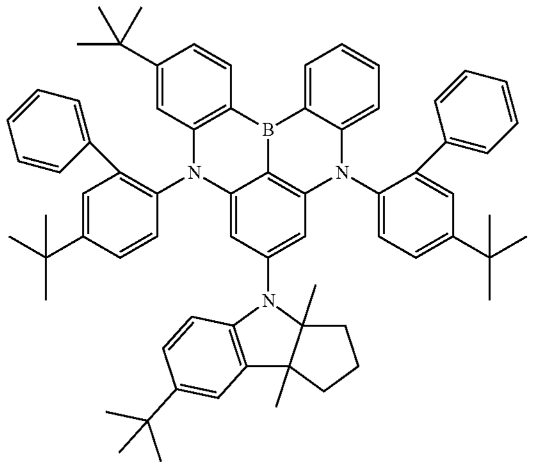
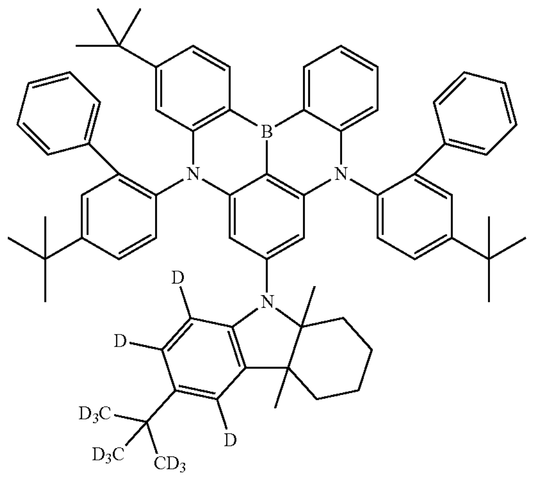

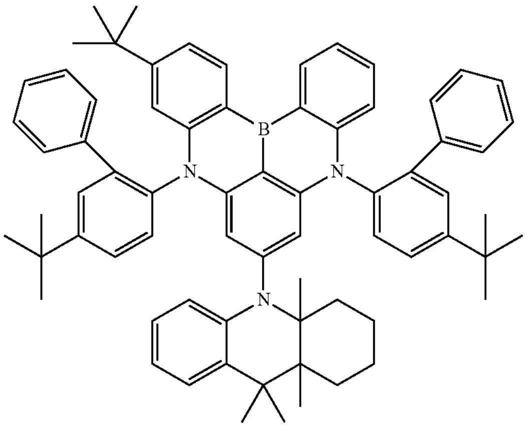
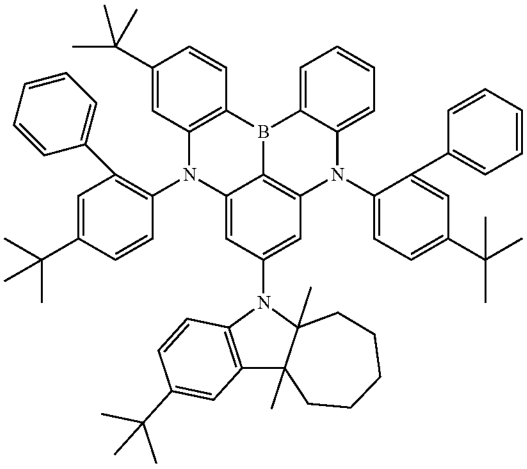
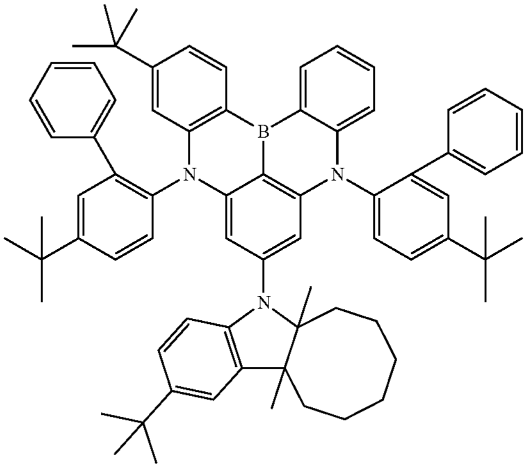
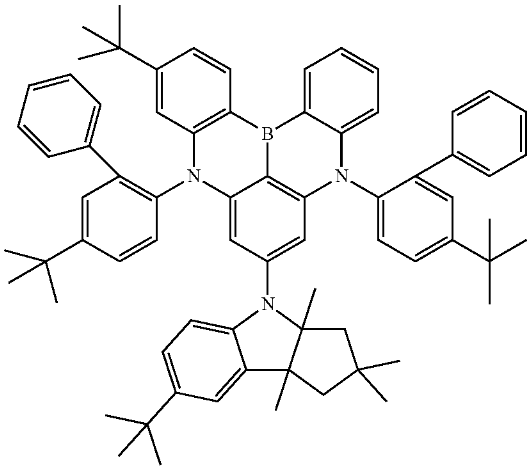
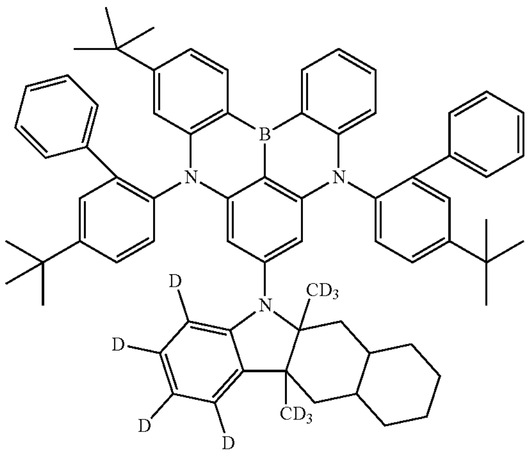
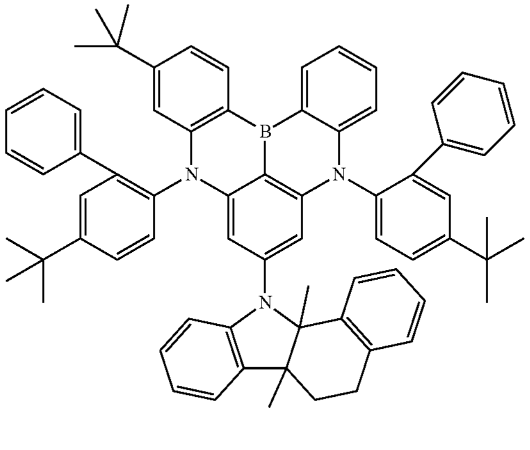

-continued
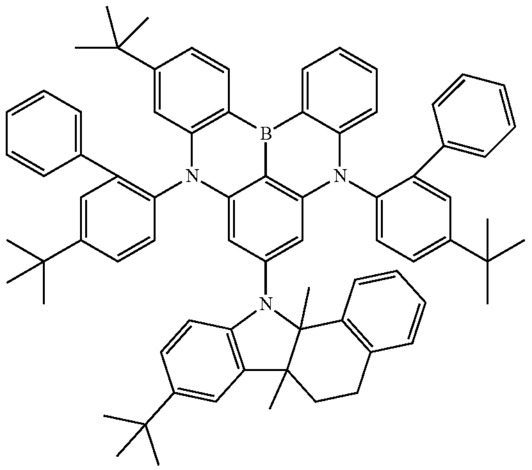
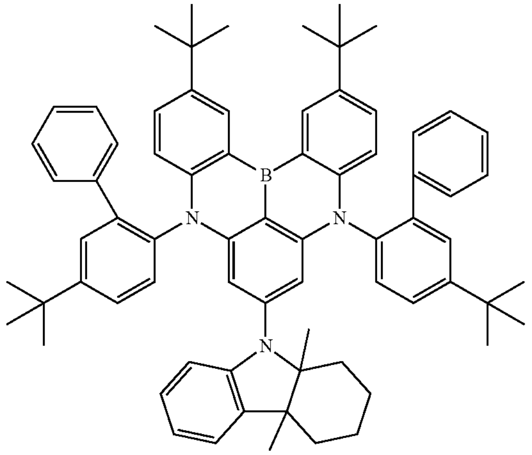
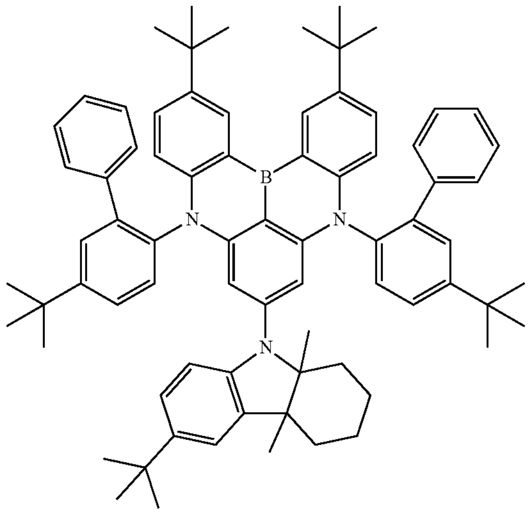
-continued
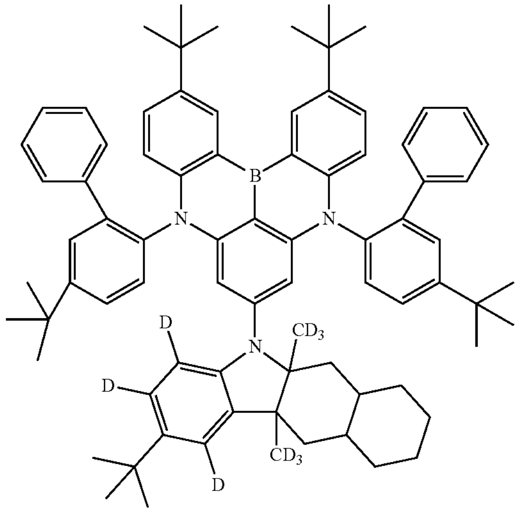
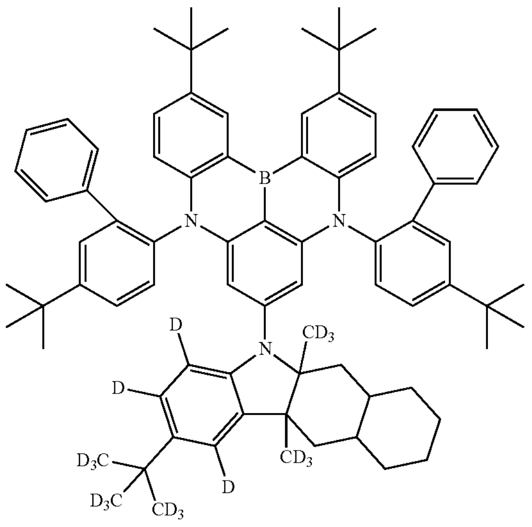
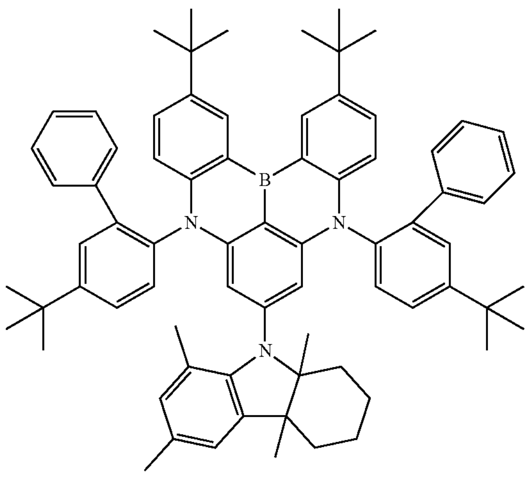

-continued
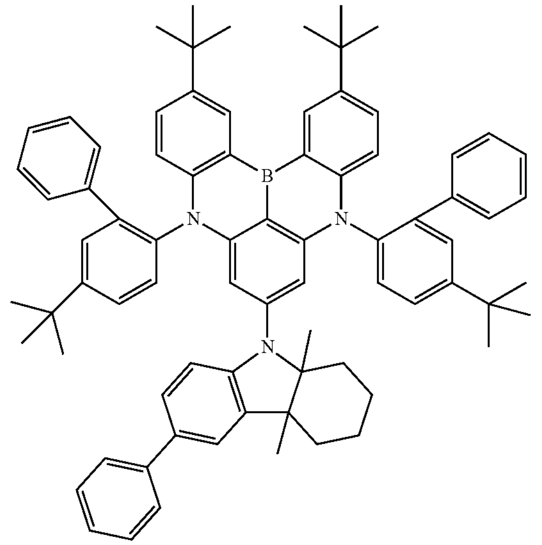
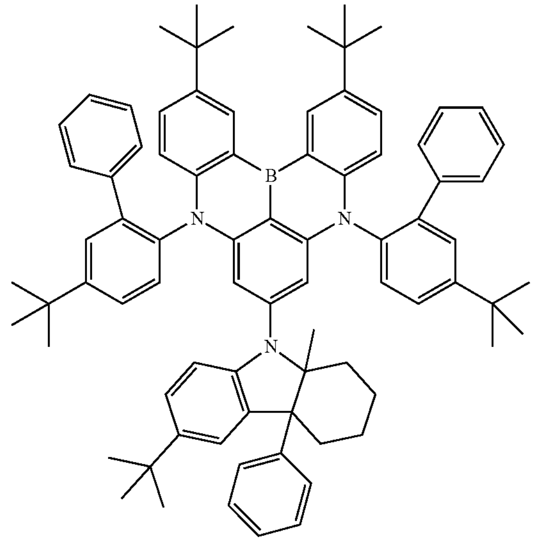
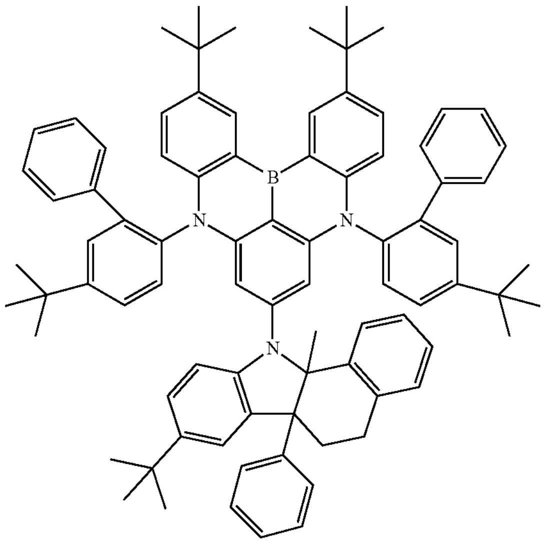
-continued
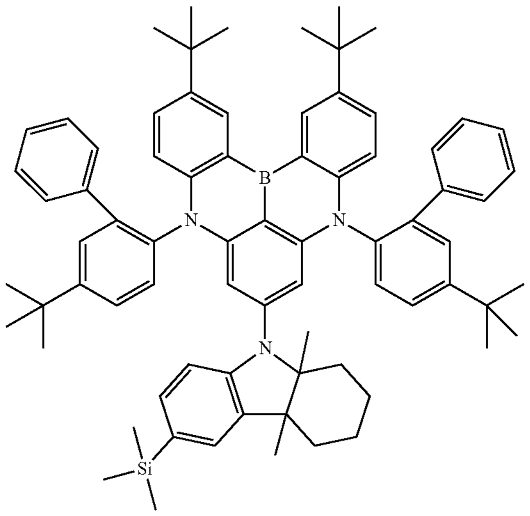
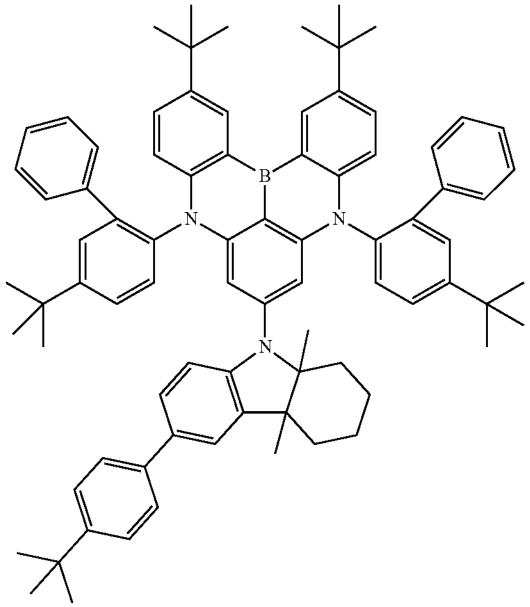
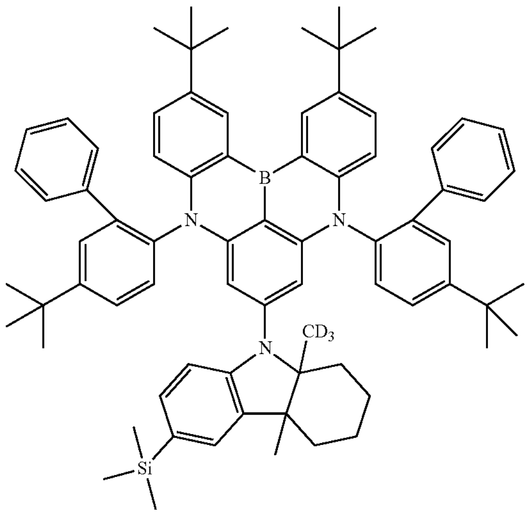

-continued
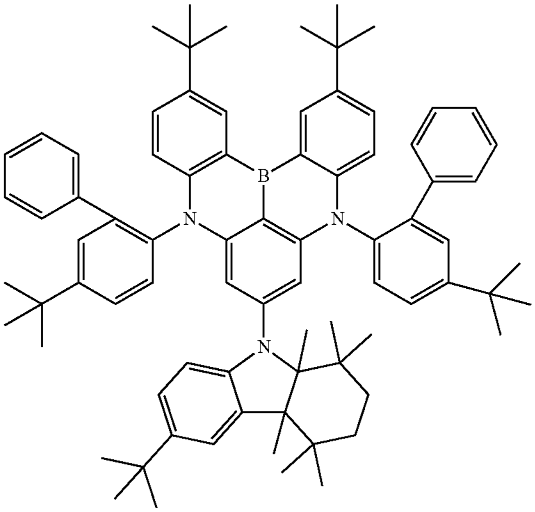
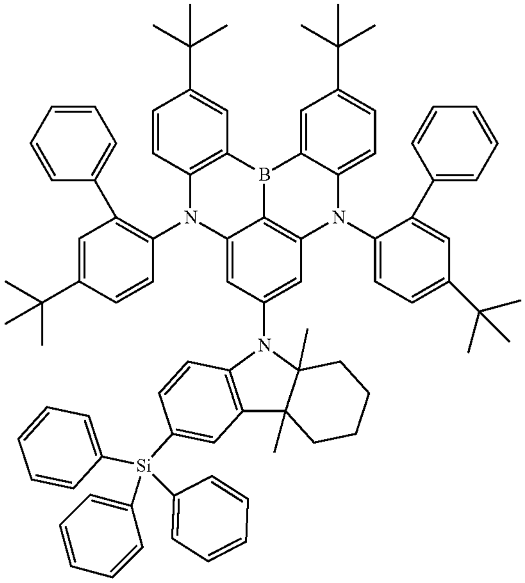
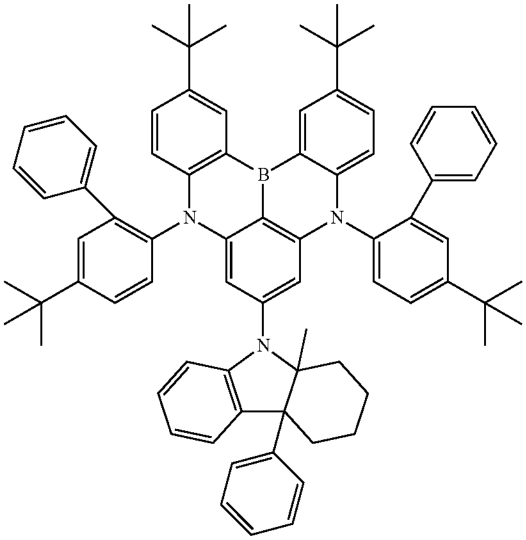
-continued
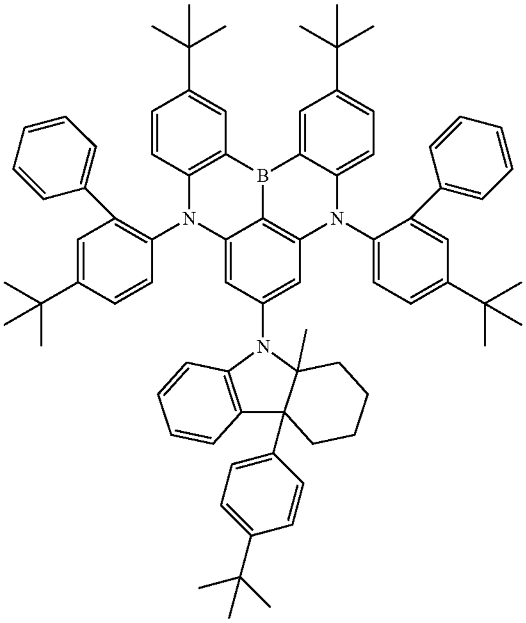
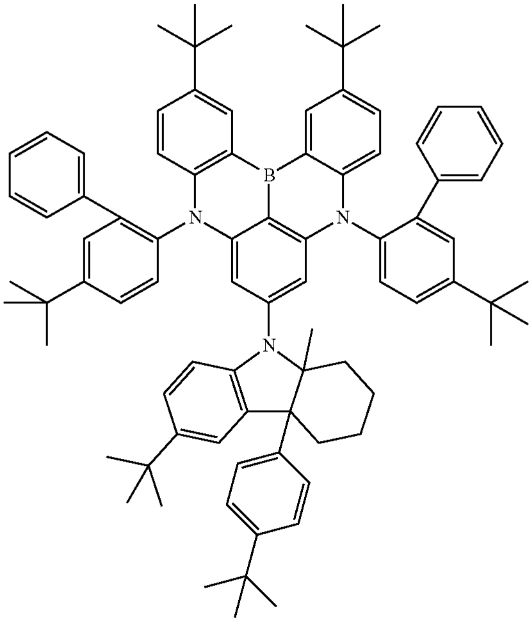

-continued
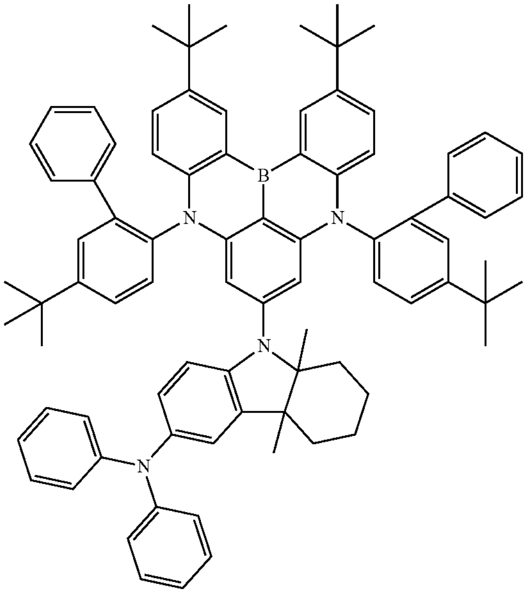
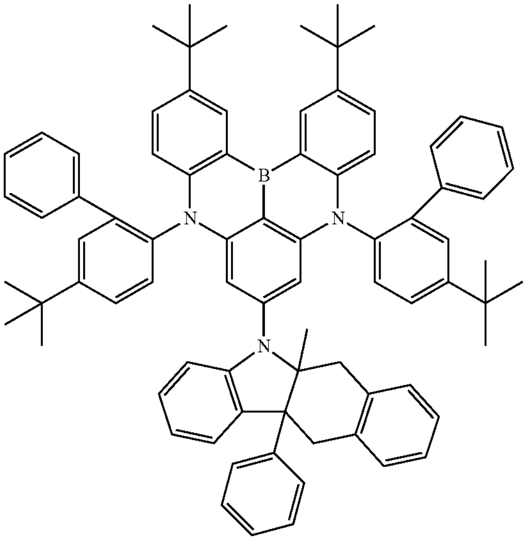
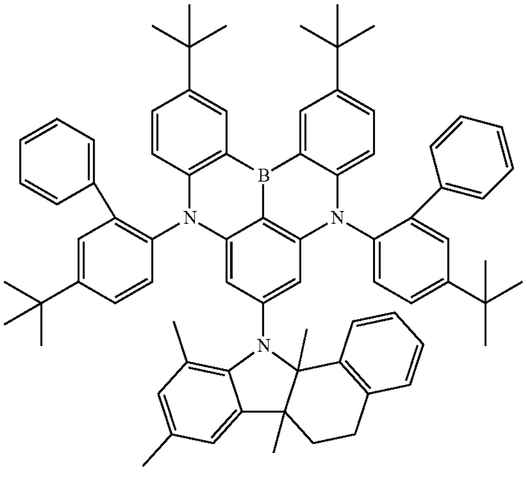
-continued
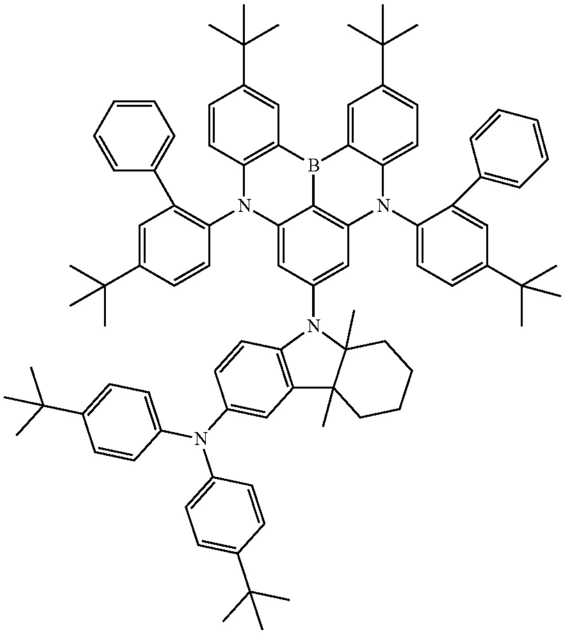
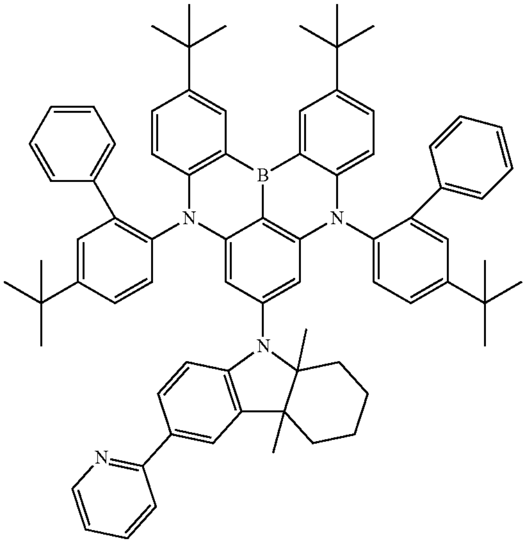
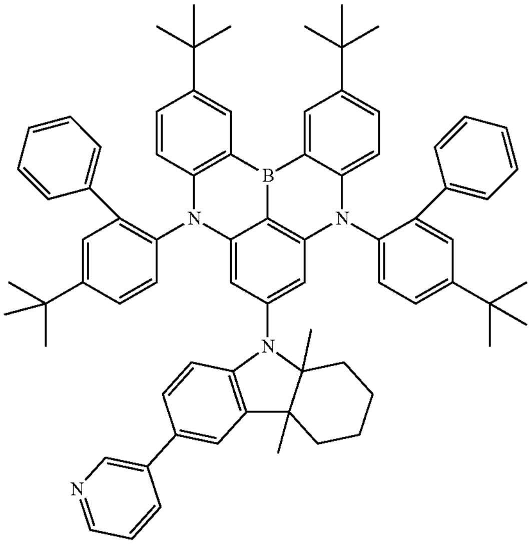

-continued
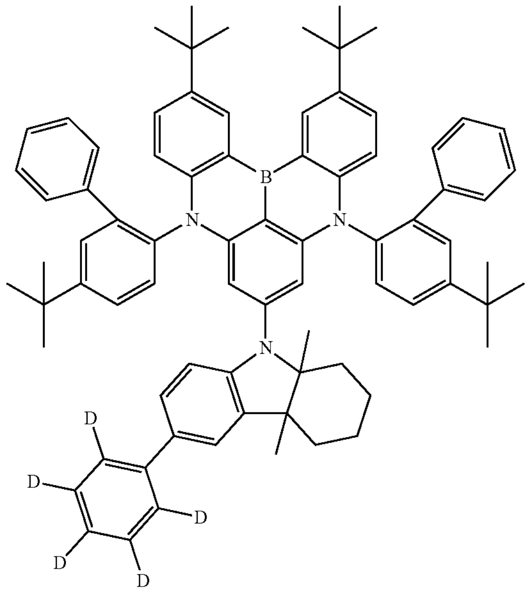
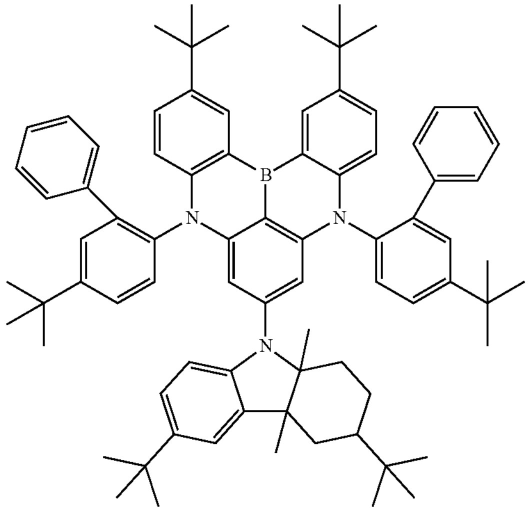
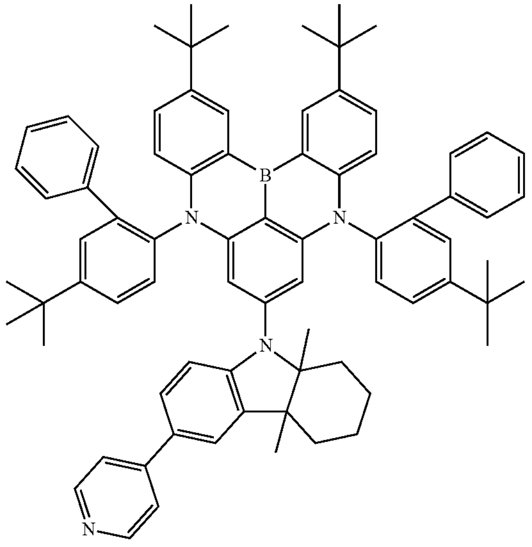
-continued
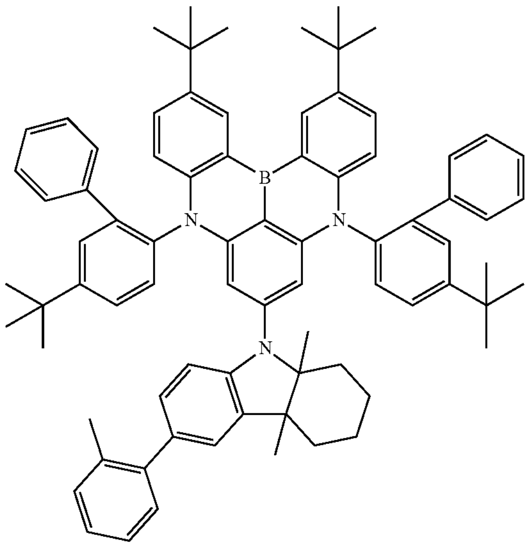
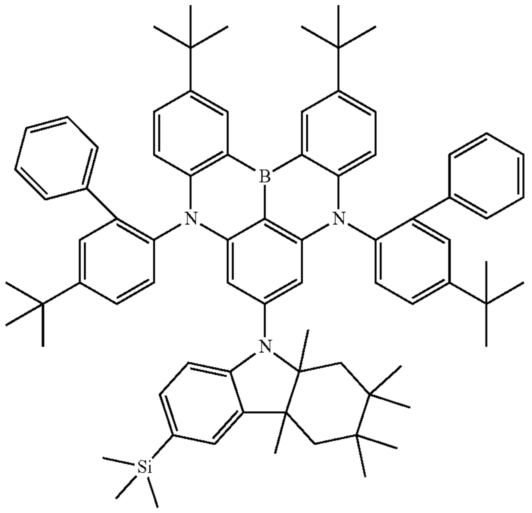
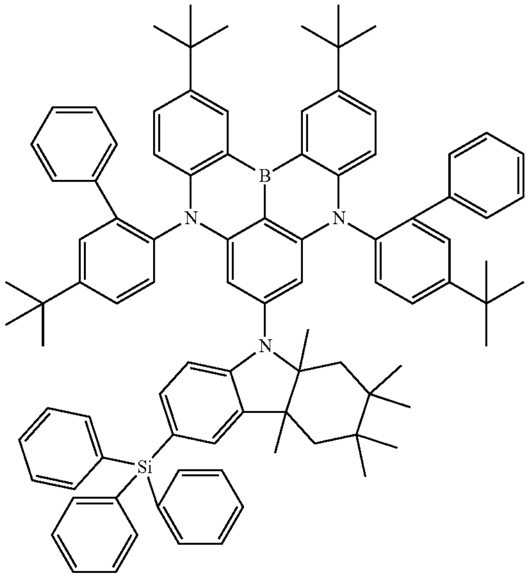

-continued
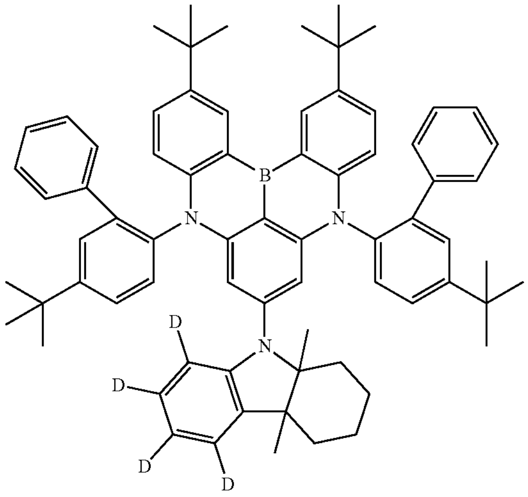
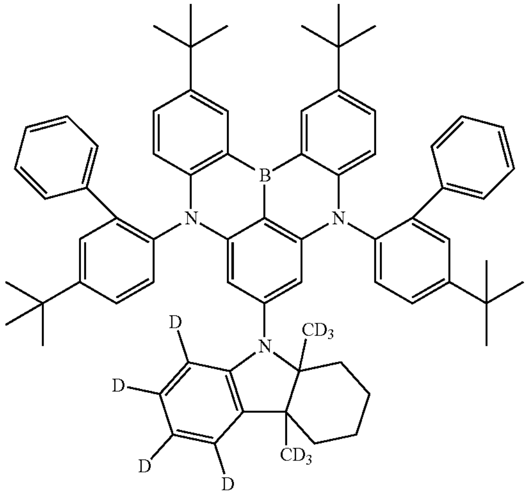
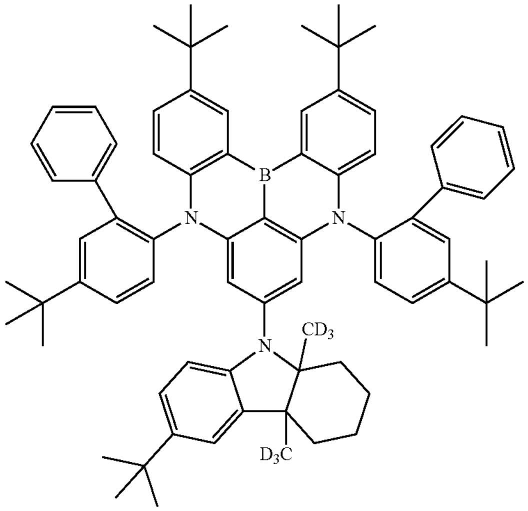
-continued
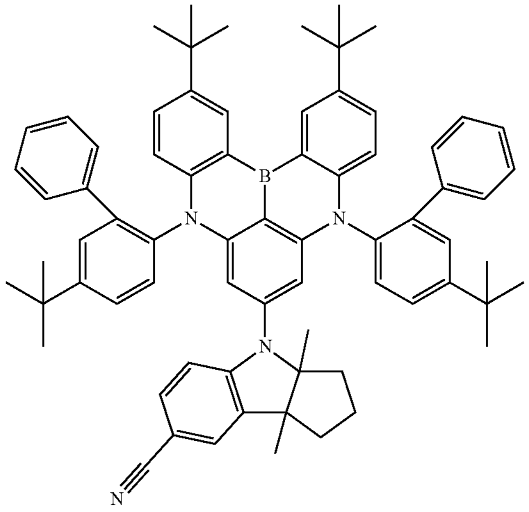
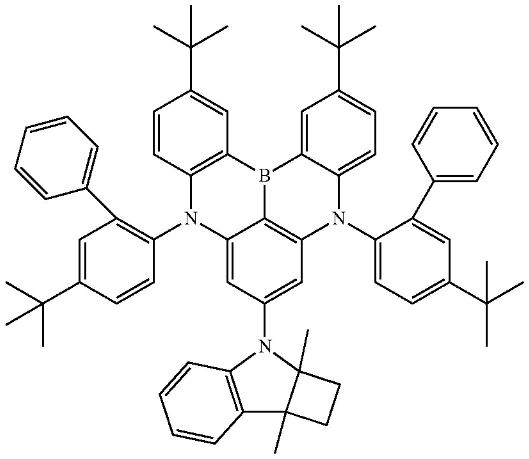
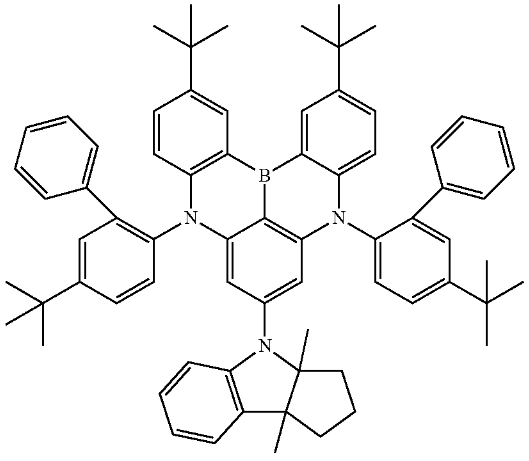

-continued
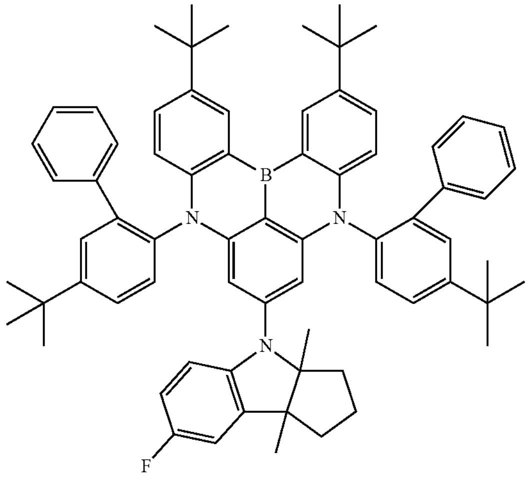 [SMILES: CC(C)(C)c1ccc2c(c1)B1c3cc(C(C)(C)C)ccc3N(c3ccc(C(C)(C)C)cc3-c3ccccc3)c3cc(N4c5ccc(F)cc5C5(C)CCCC45C)cc(c31)N2c1ccc(C(C)(C)C)cc1-c1ccccc1]
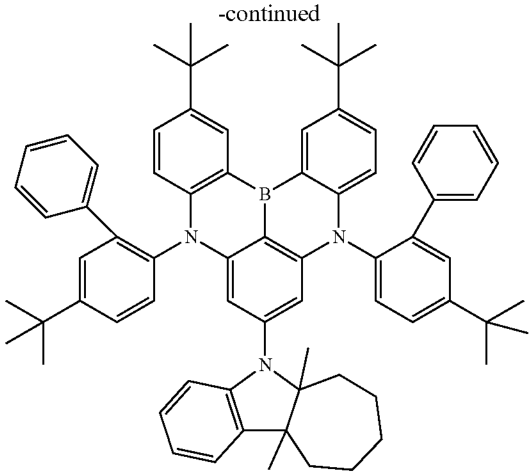
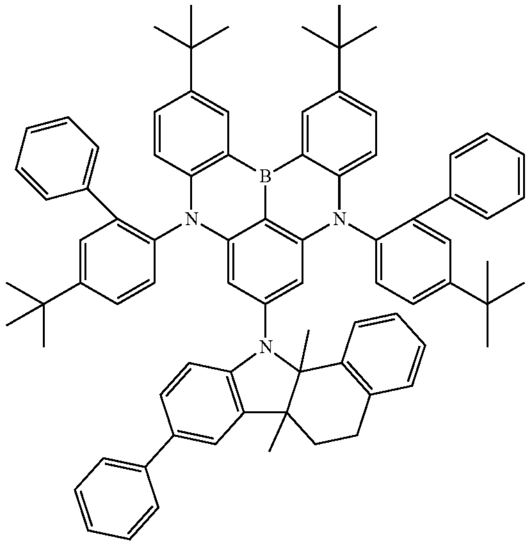
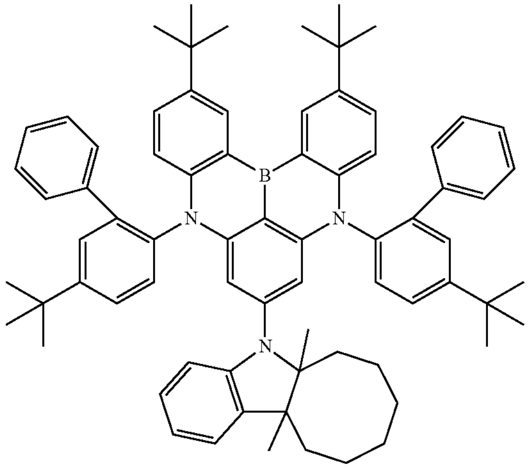
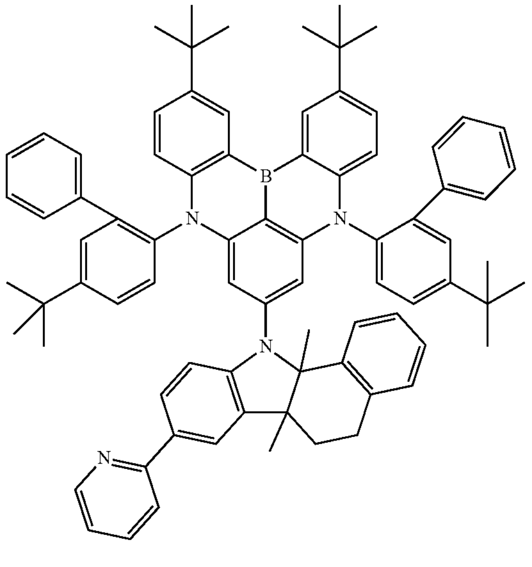
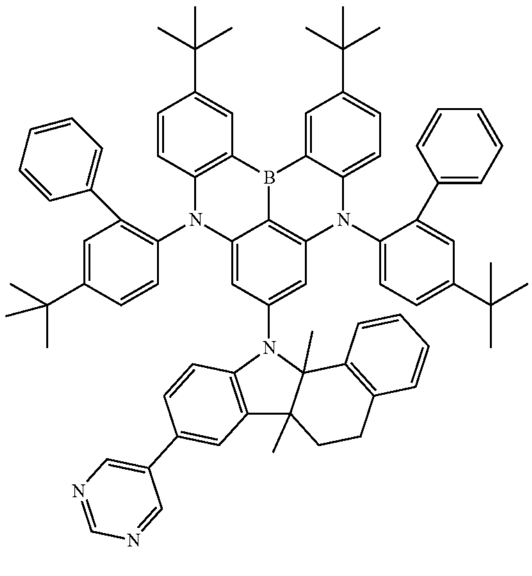

-continued
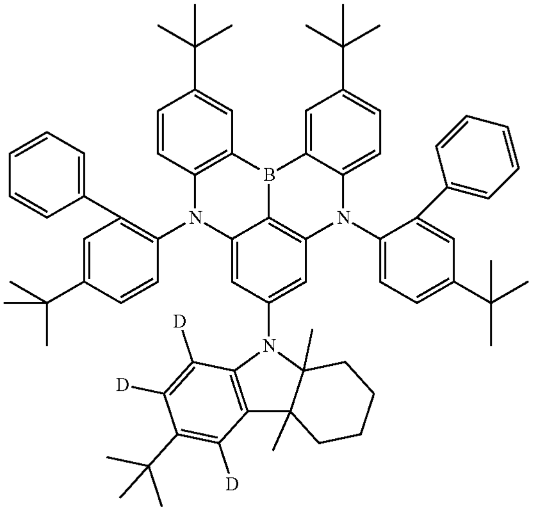
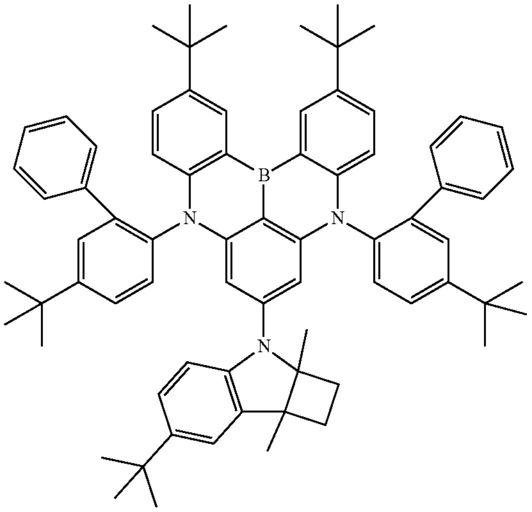
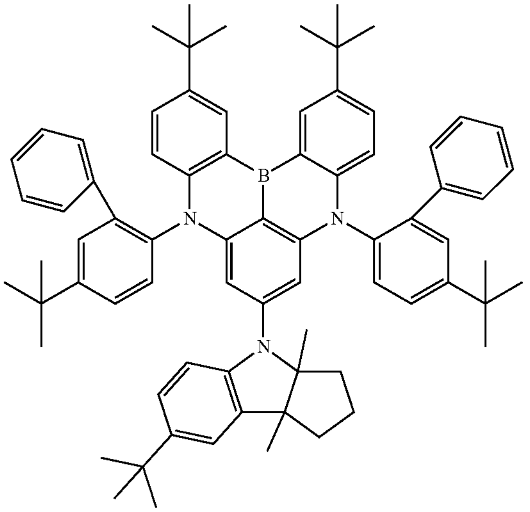
-continued
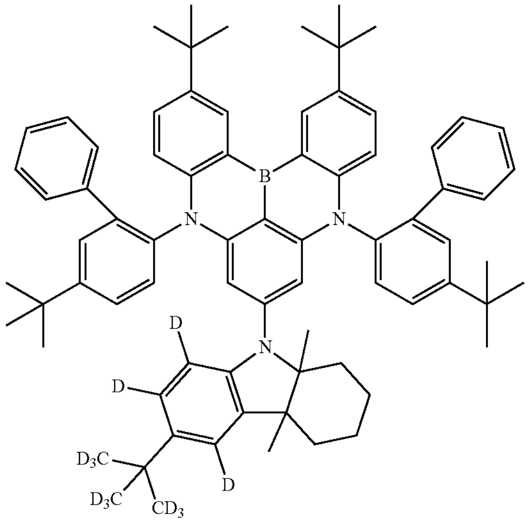
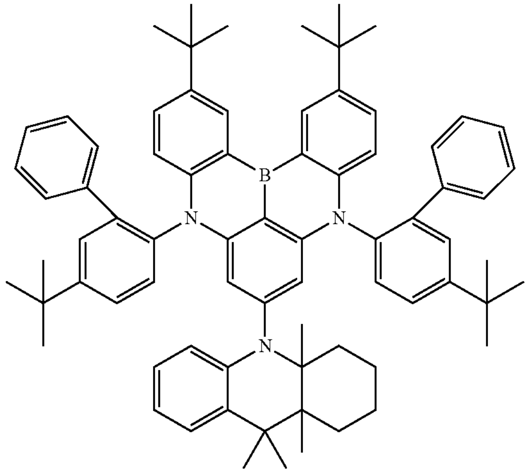
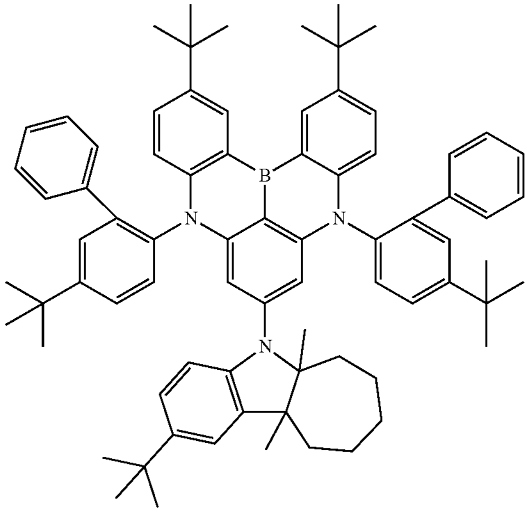

-continued
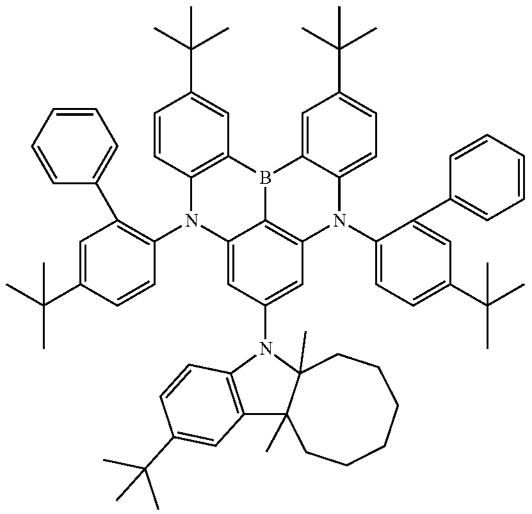
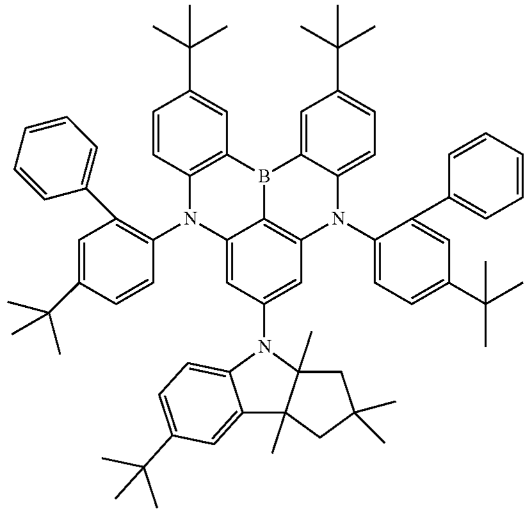
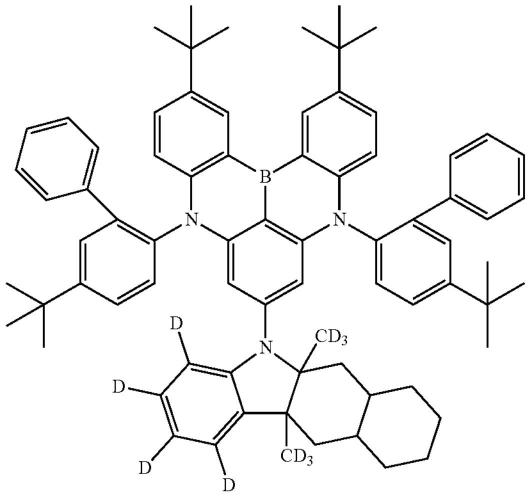
-continued
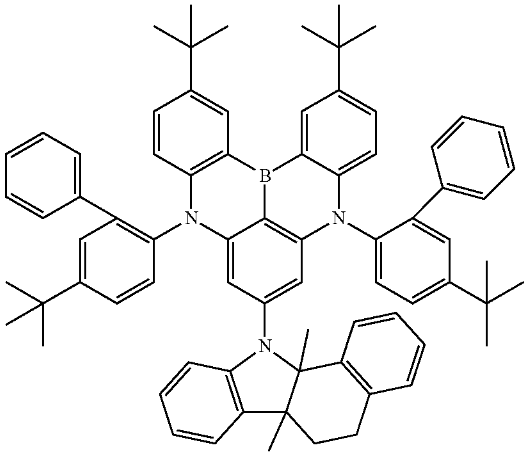
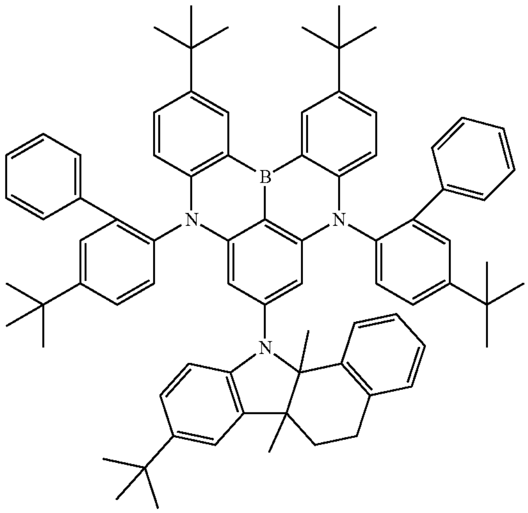
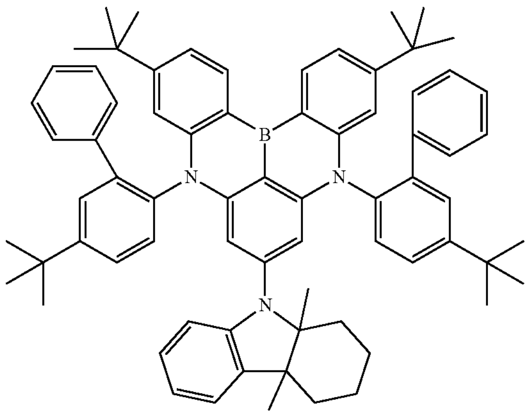

-continued
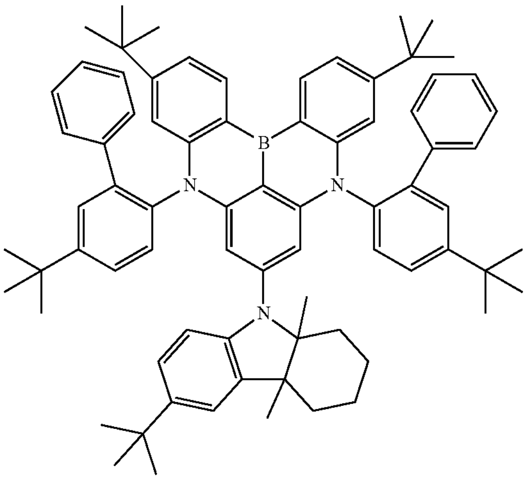
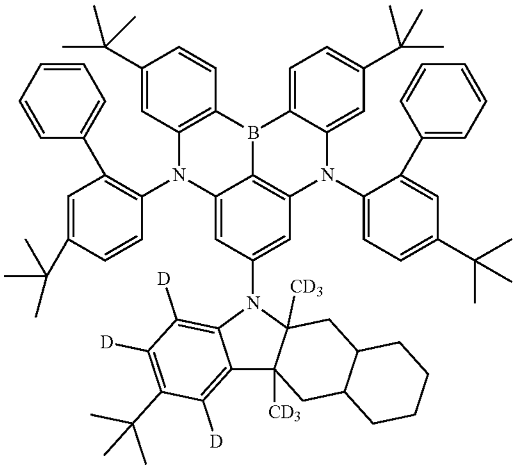
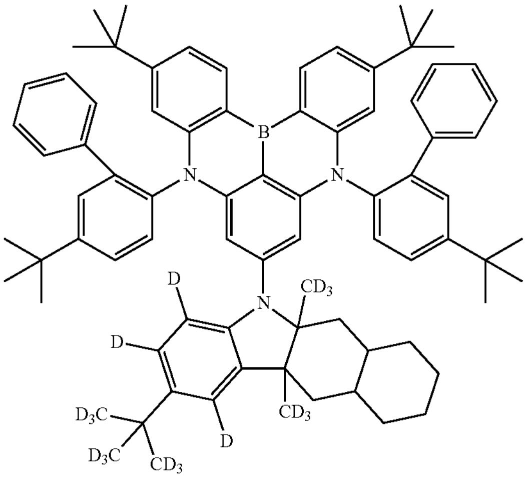
-continued
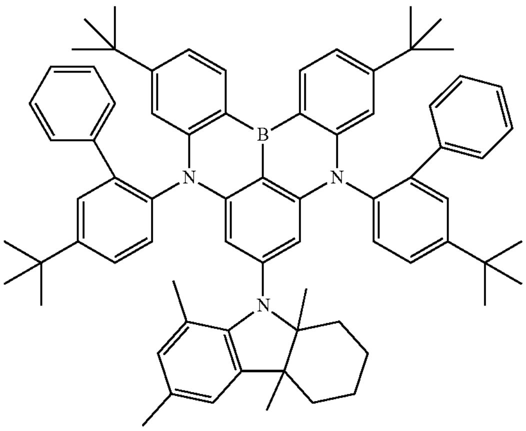
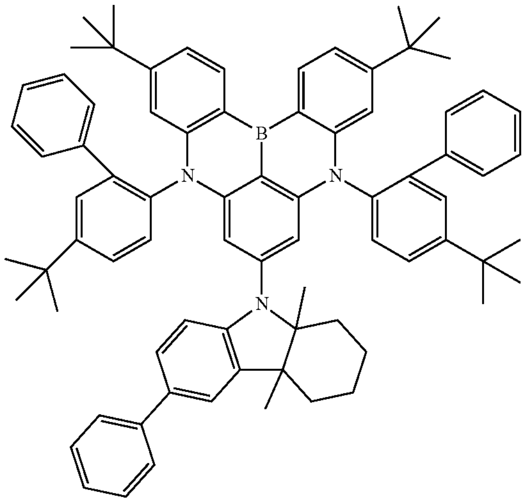
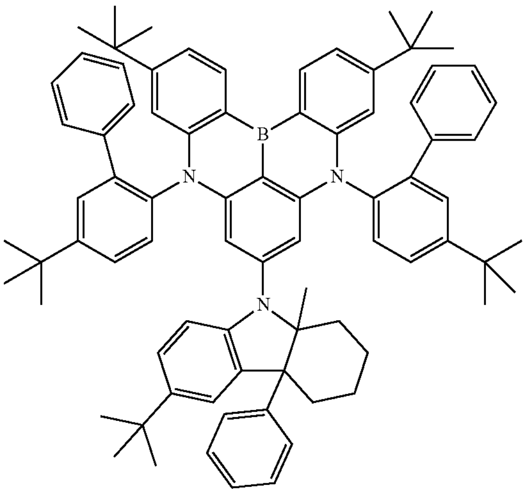

-continued
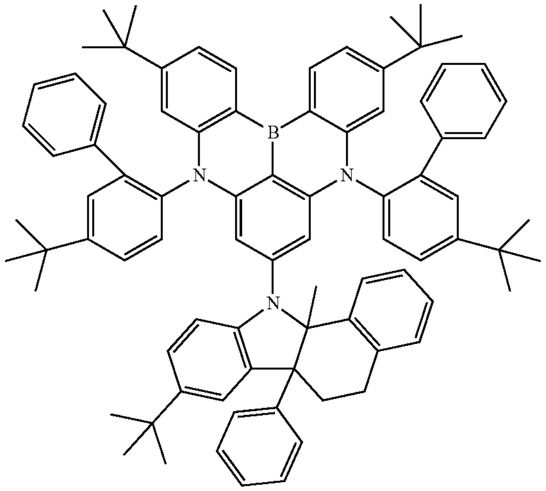
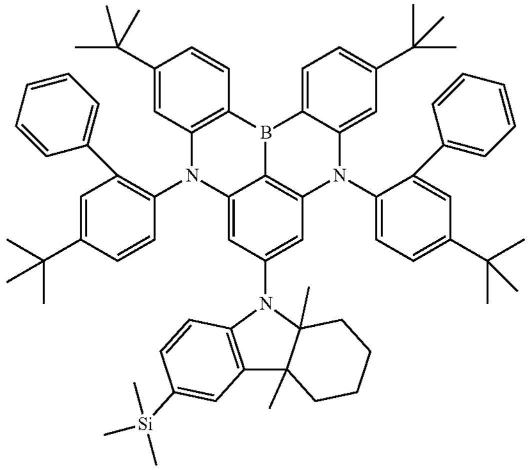
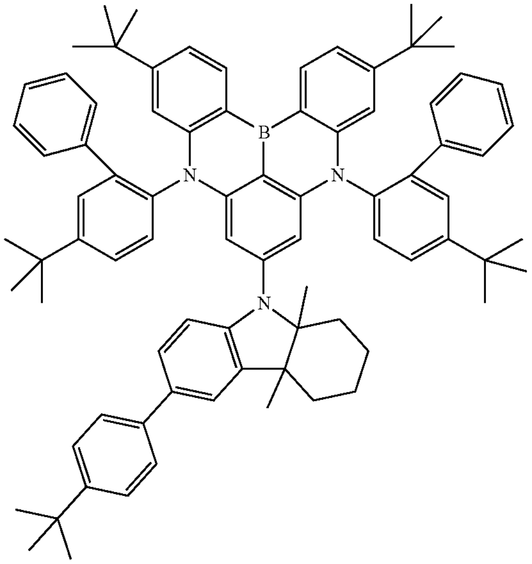
-continued
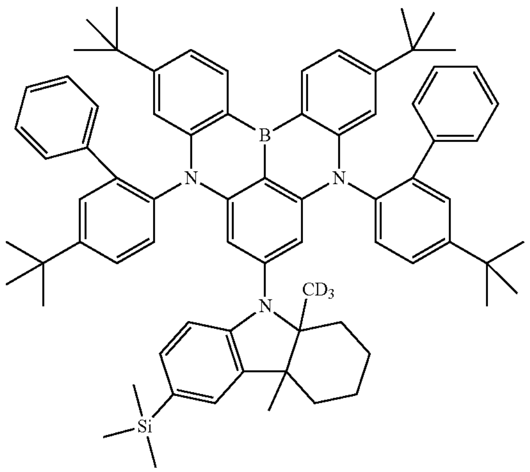
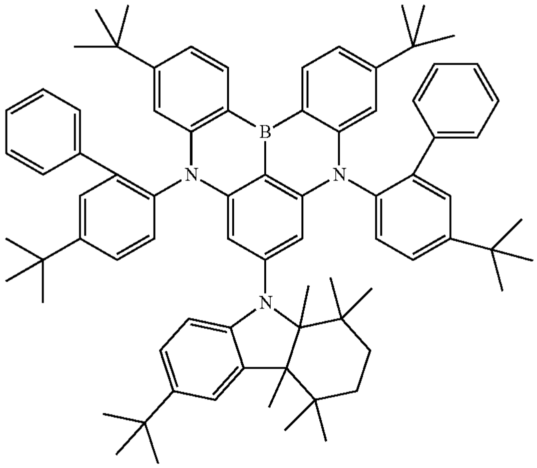
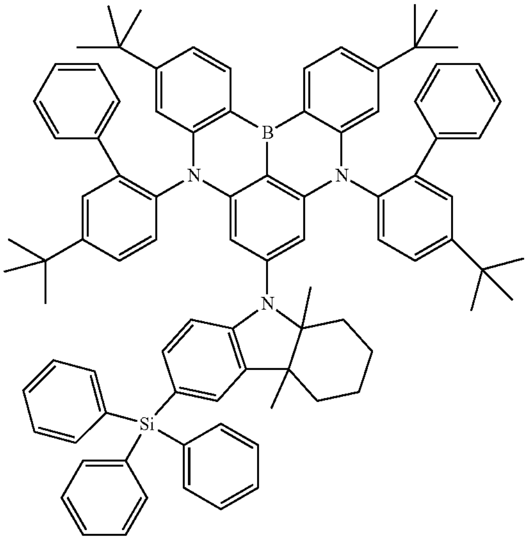

-continued
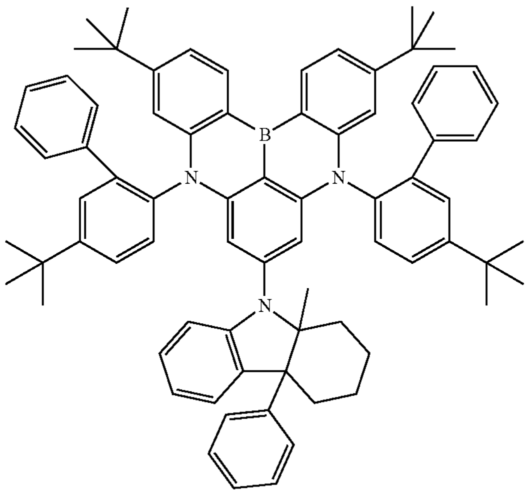
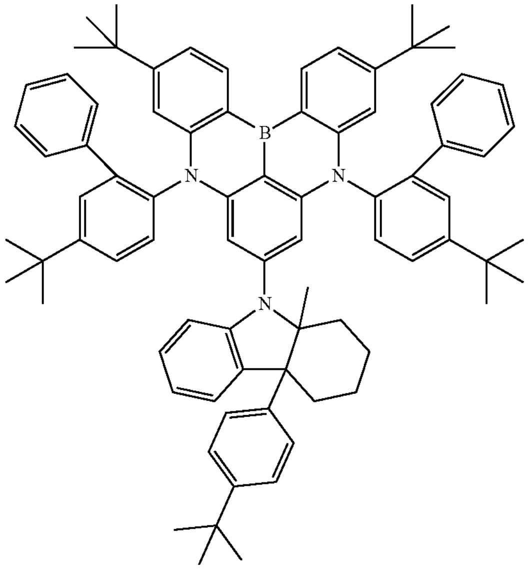
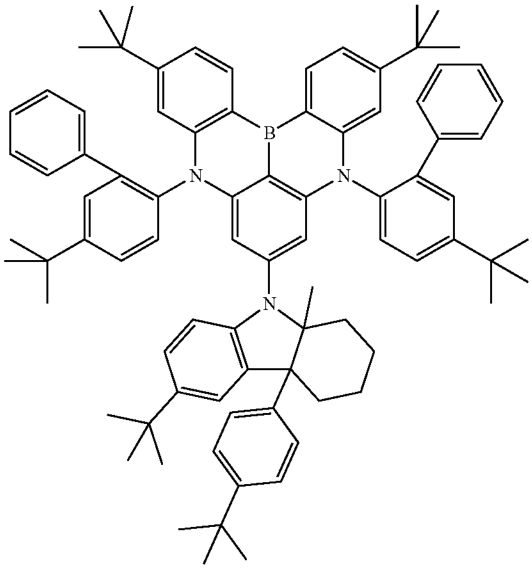
-continued
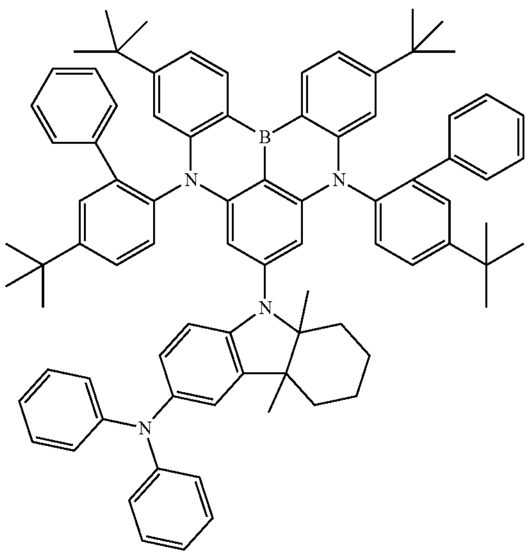
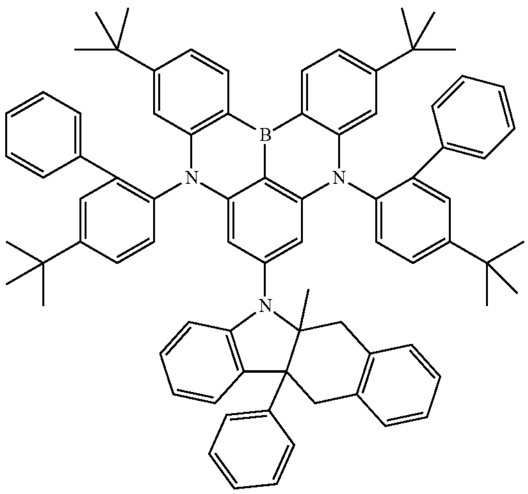
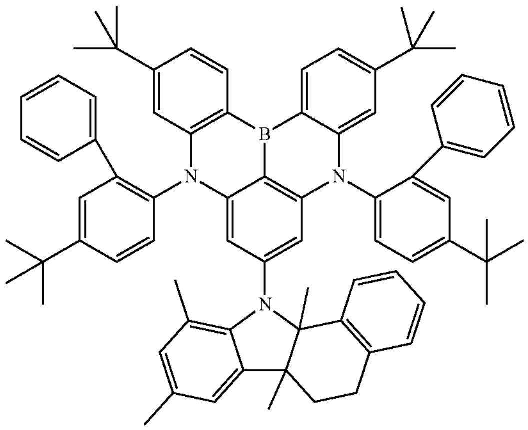

-continued
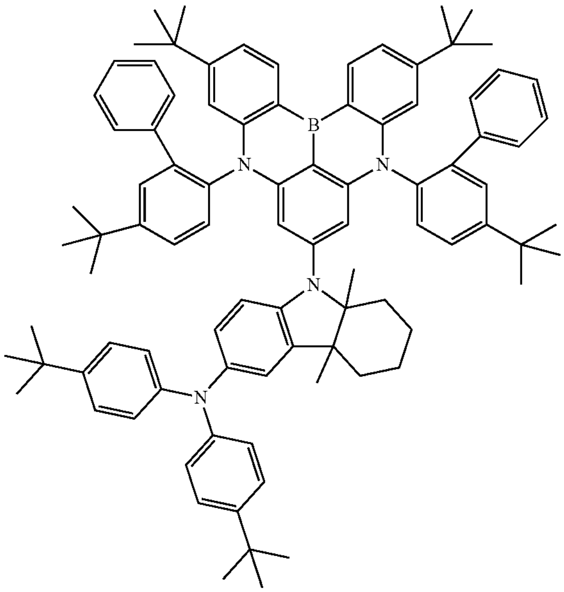
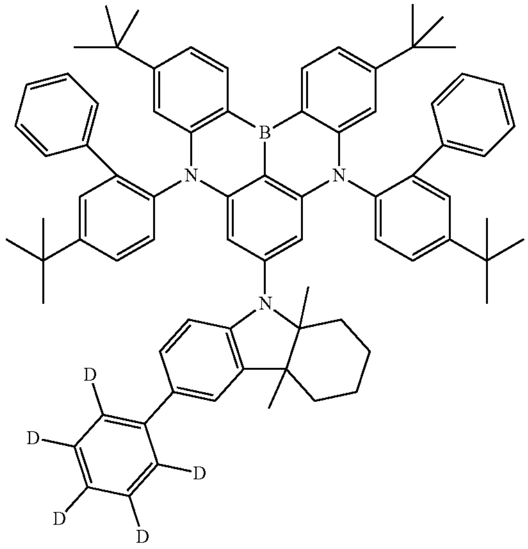
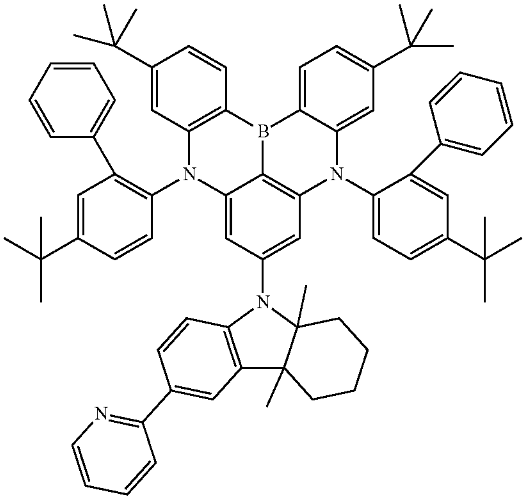
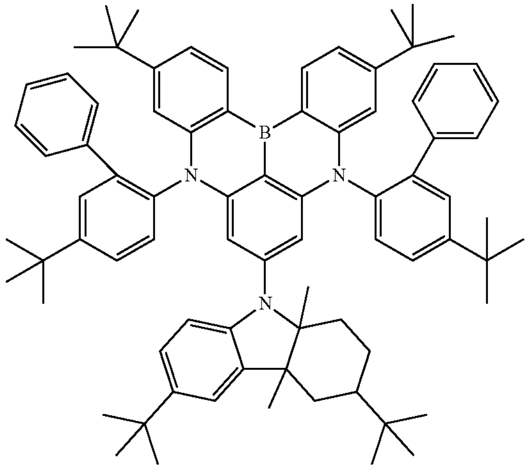
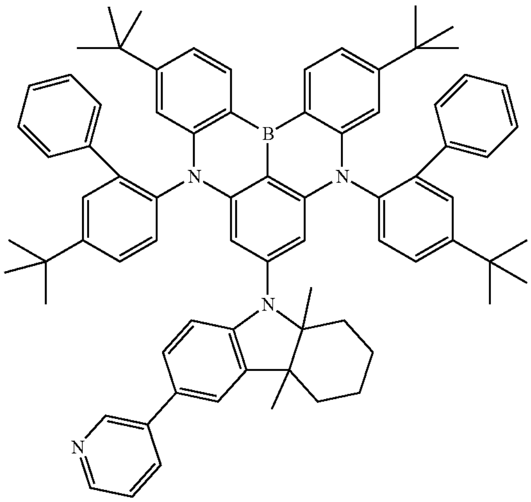
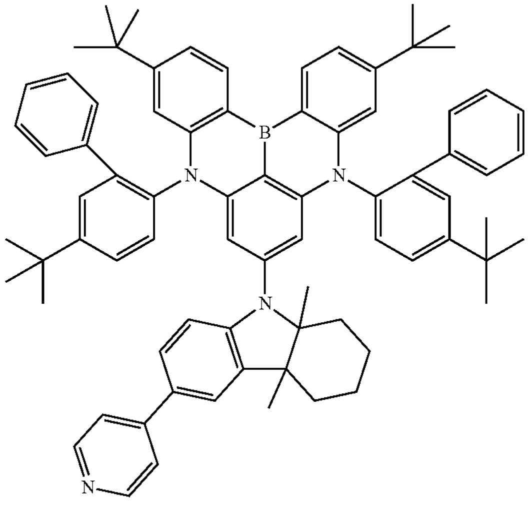

-continued
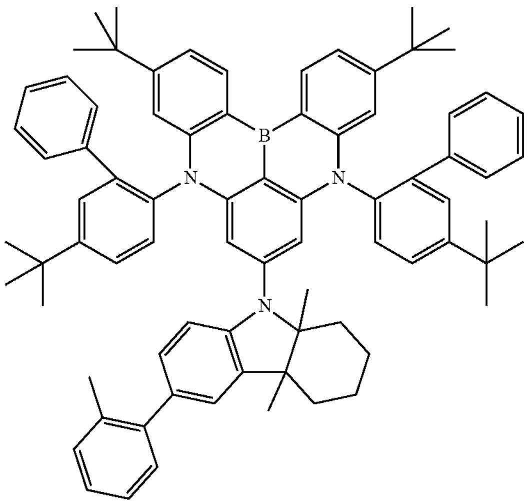
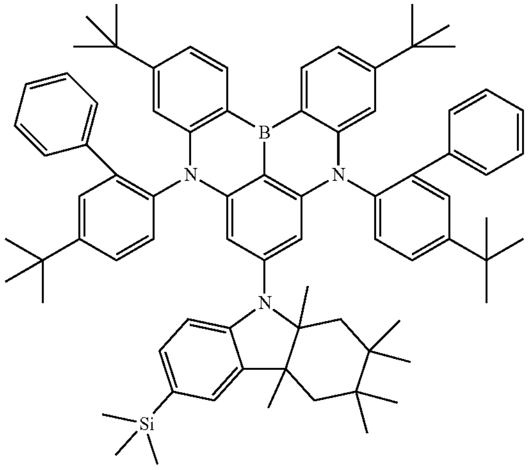
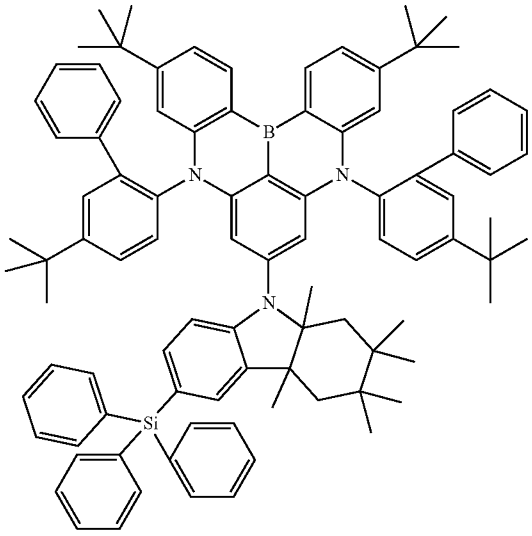
-continued
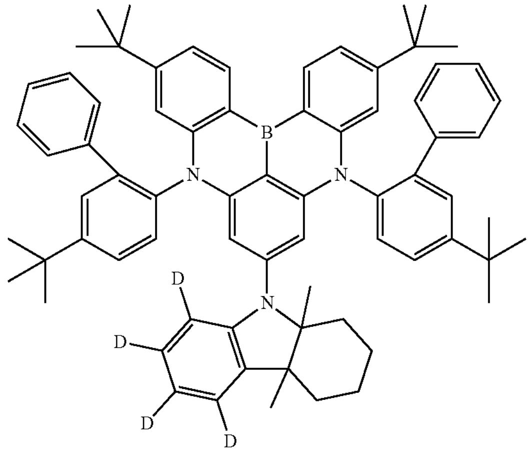
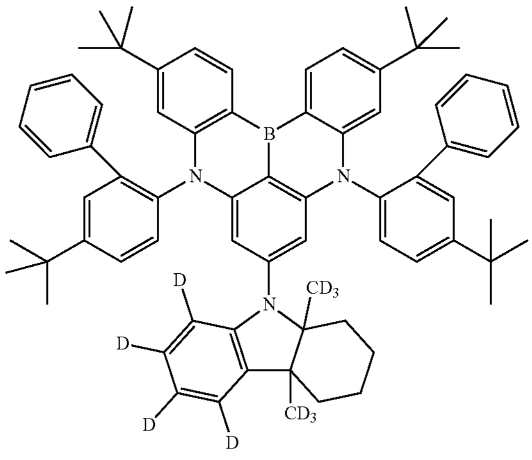
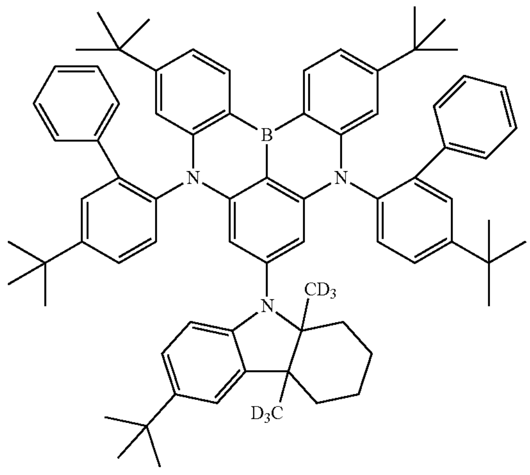

-continued
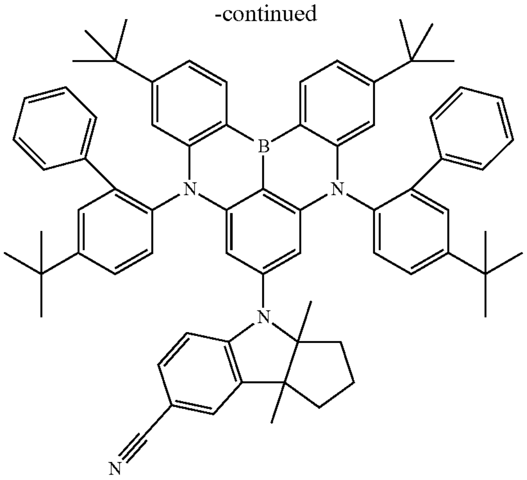
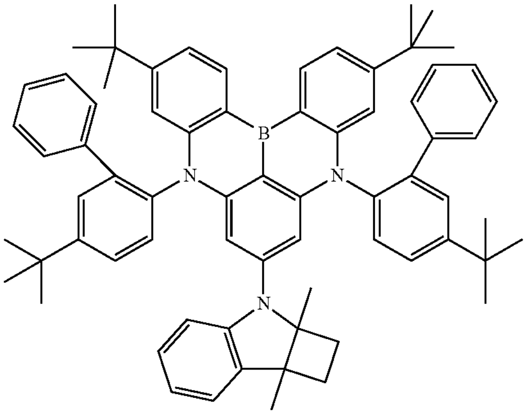
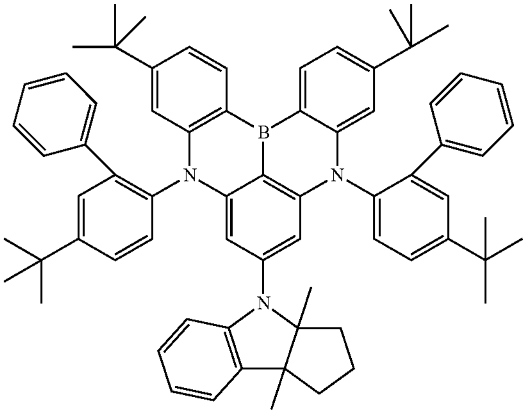
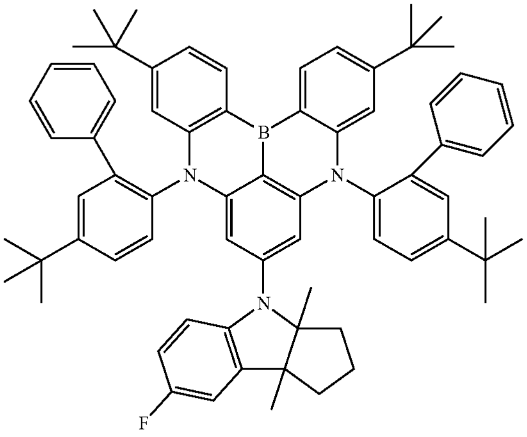
-continued
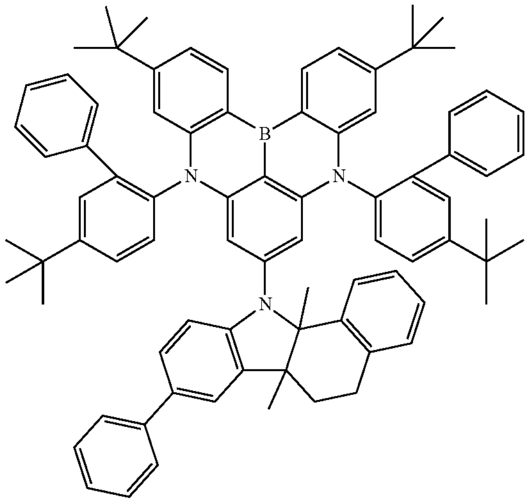
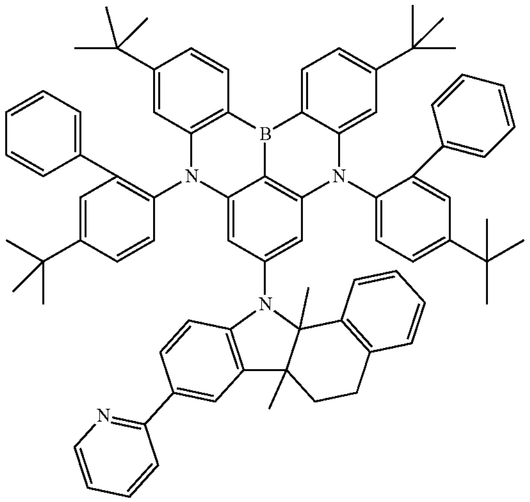
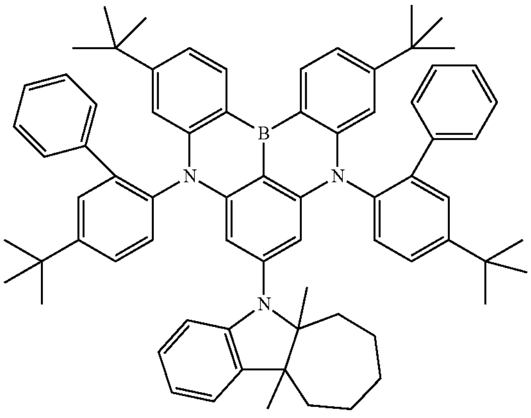

-continued
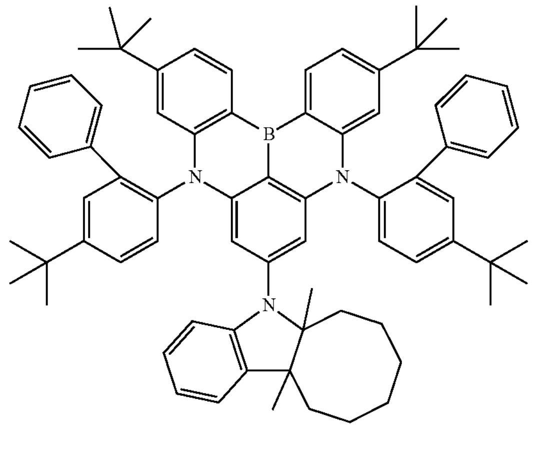
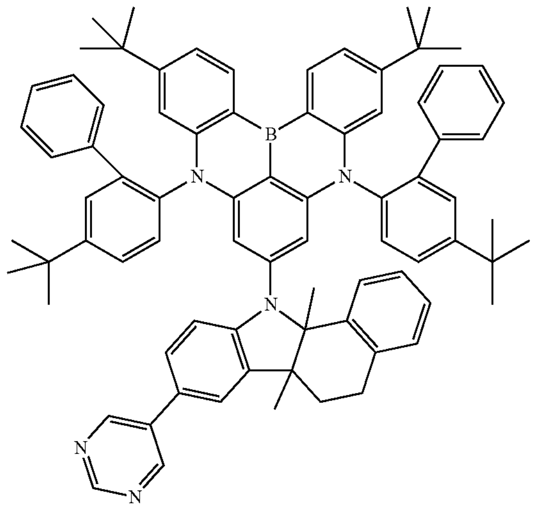
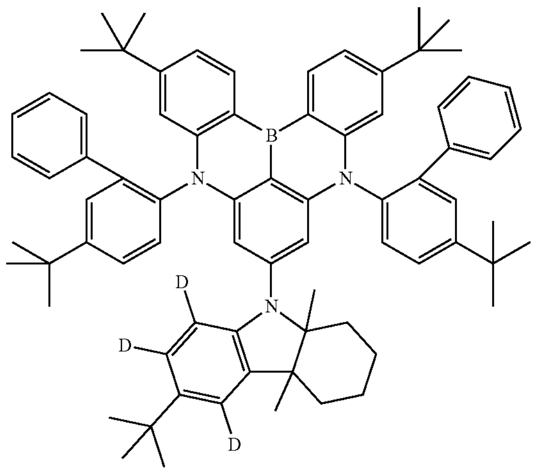
-continued
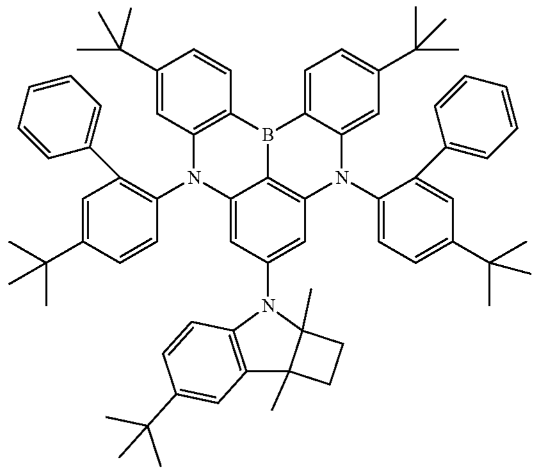
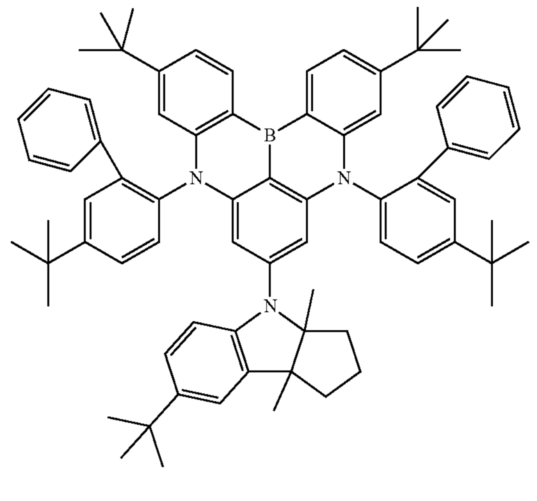
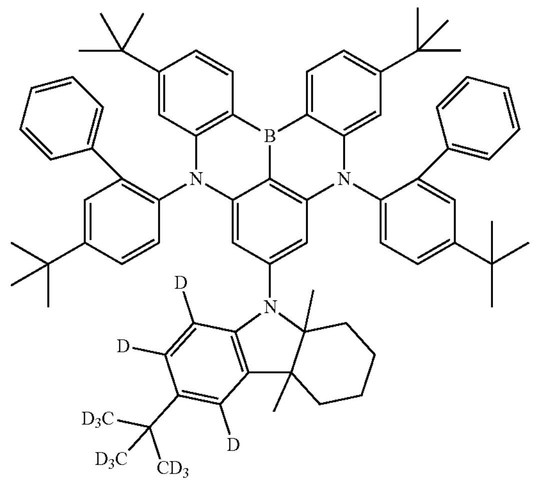

-continued
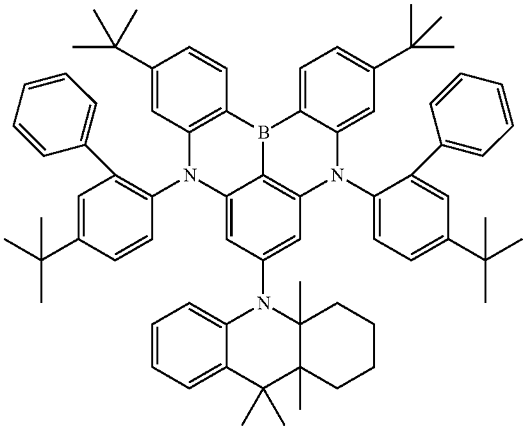
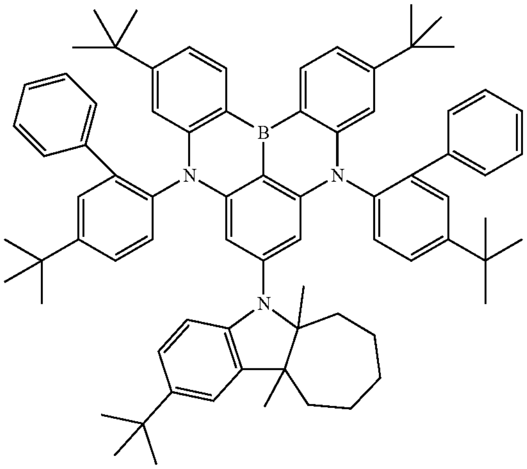
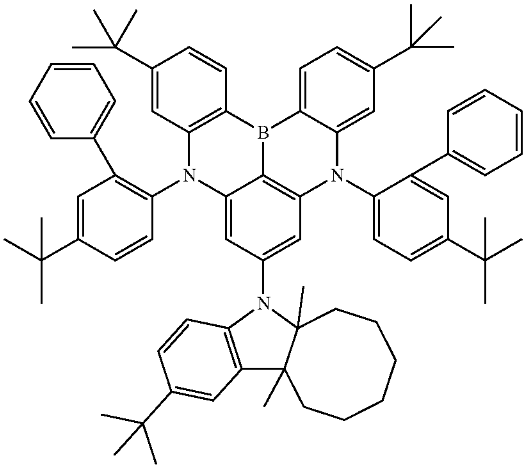
-continued
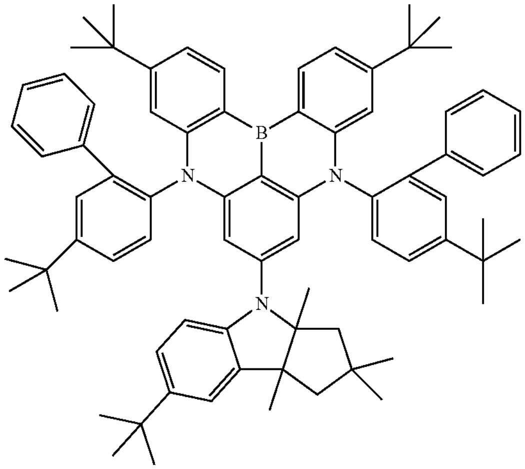
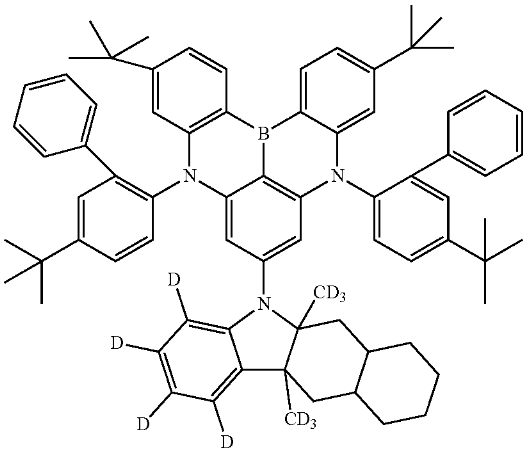
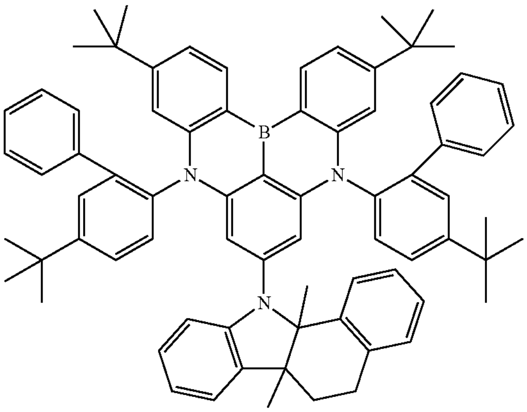

-continued
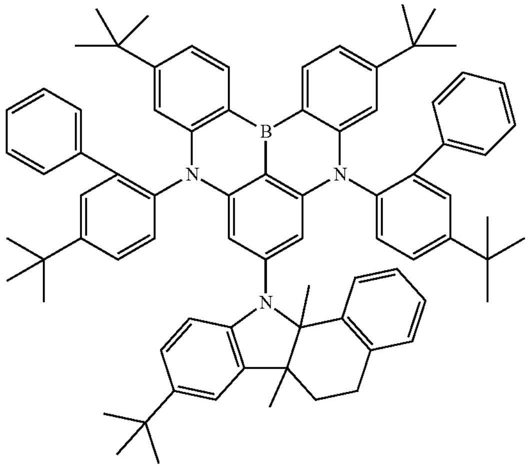
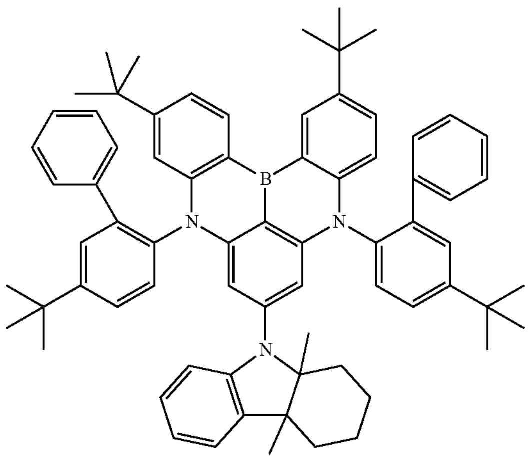
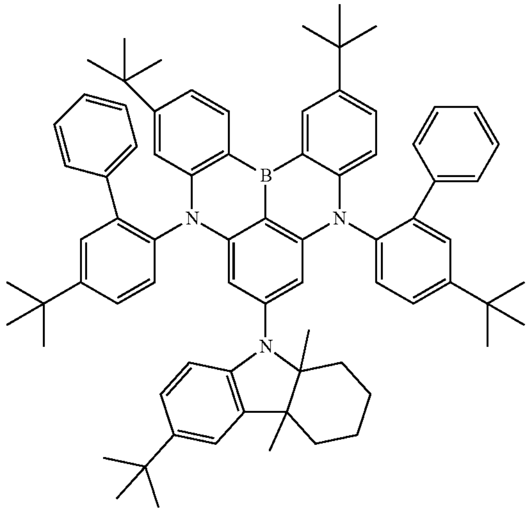
-continued
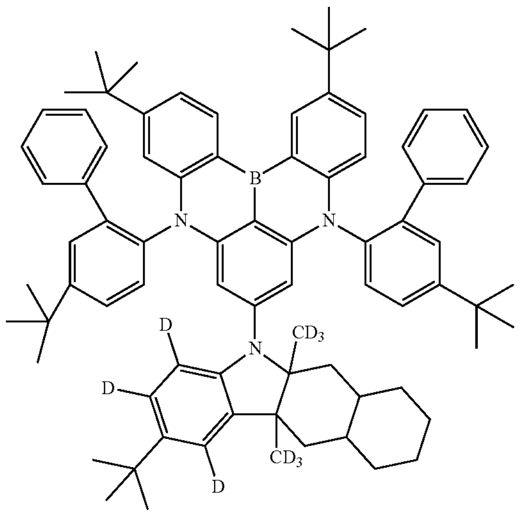
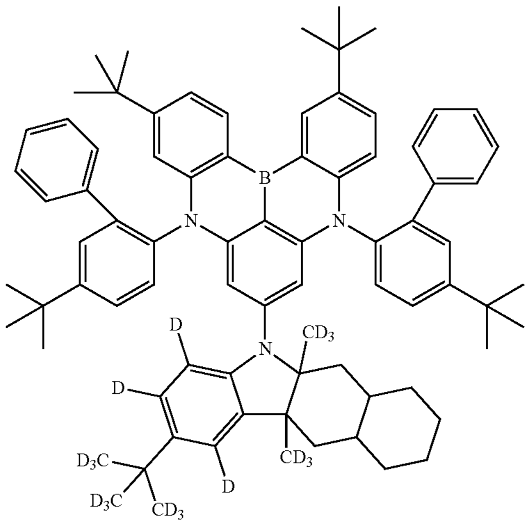
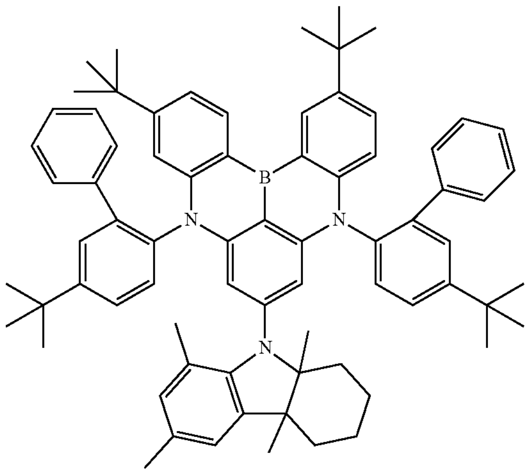

-continued
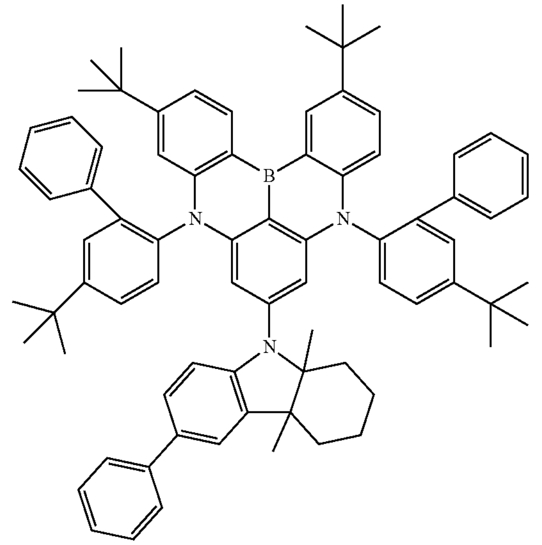
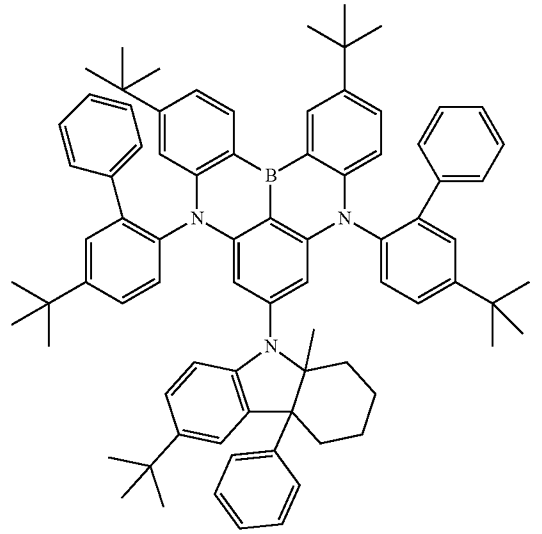
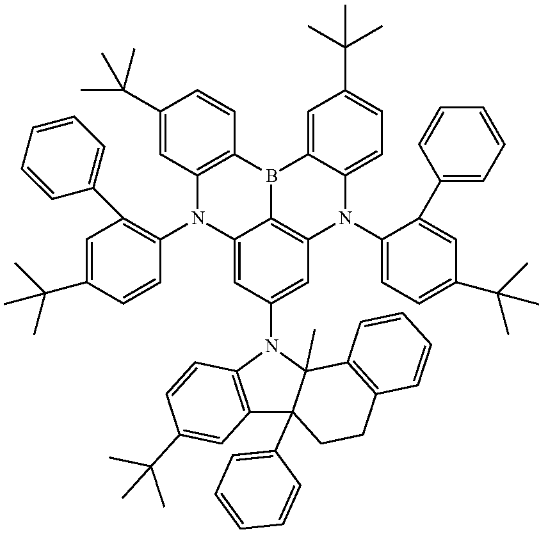
-continued
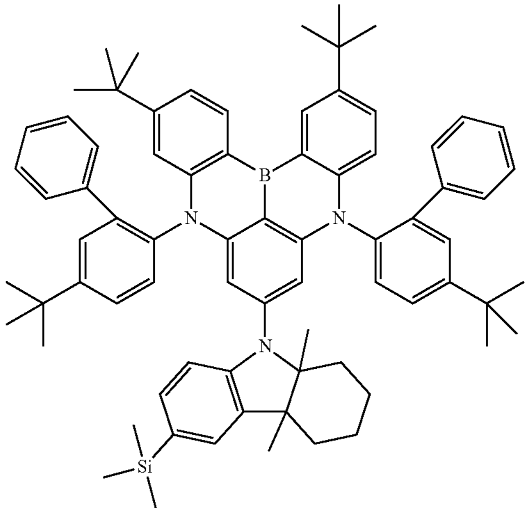
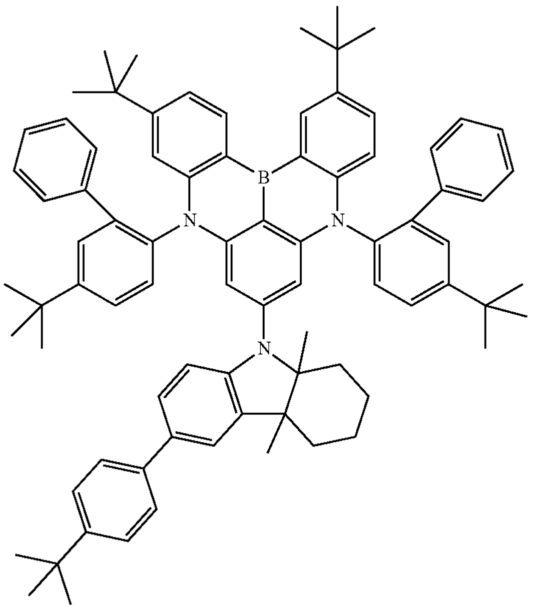
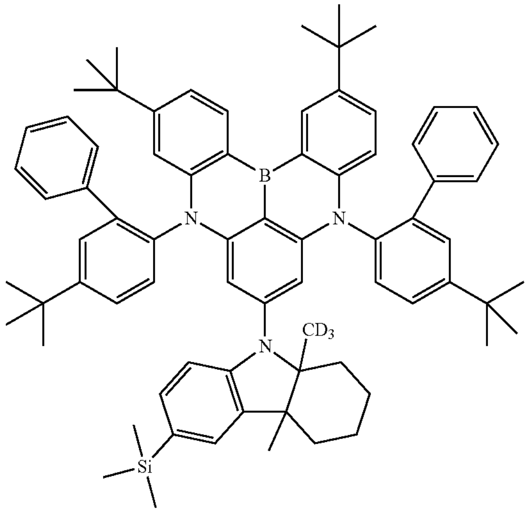

-continued
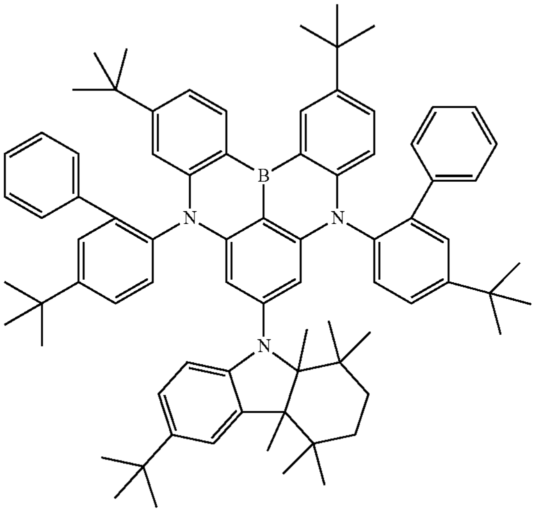
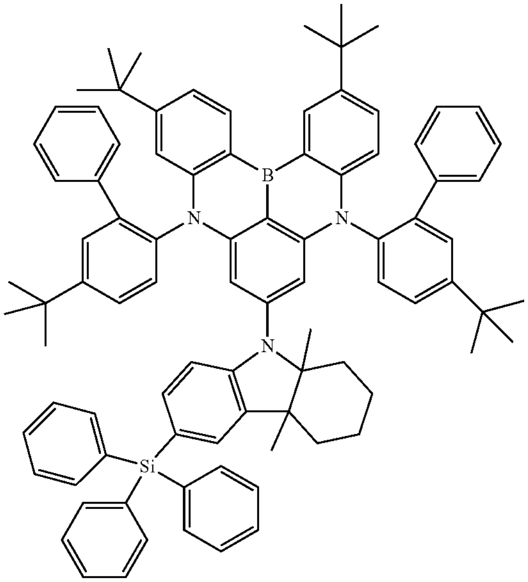
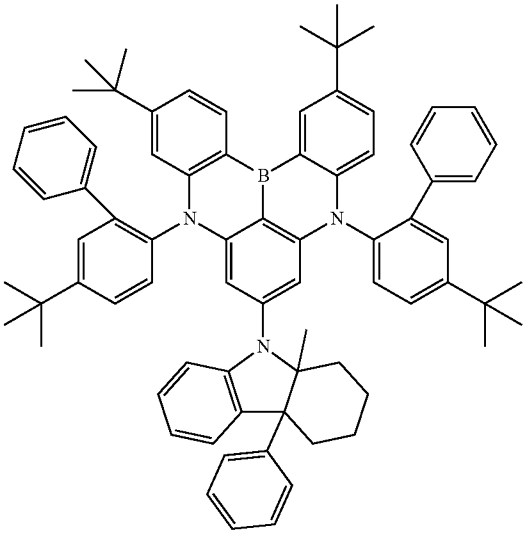
-continued
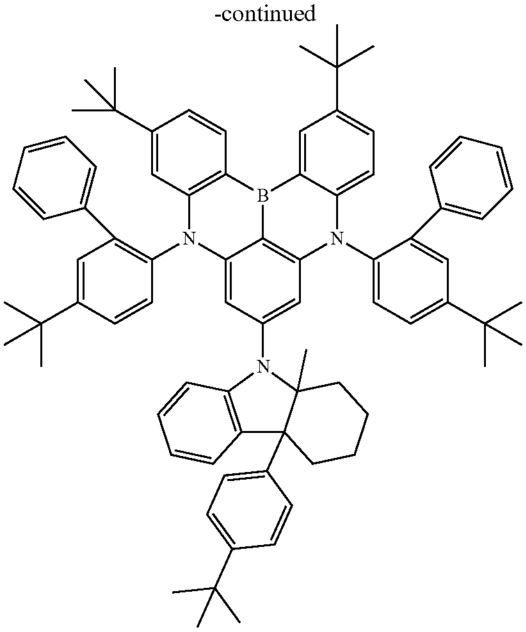
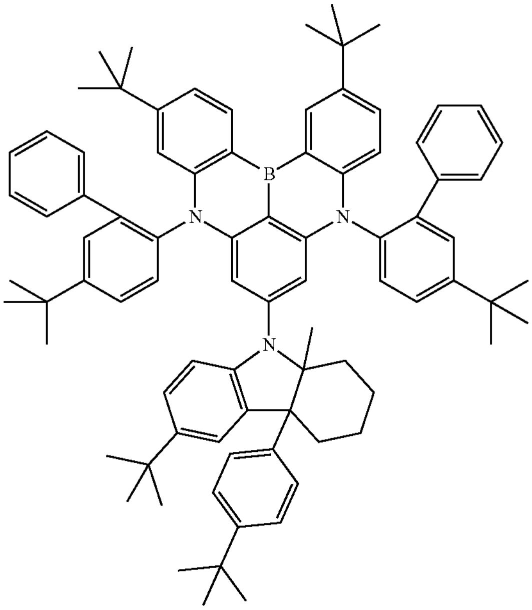

-continued
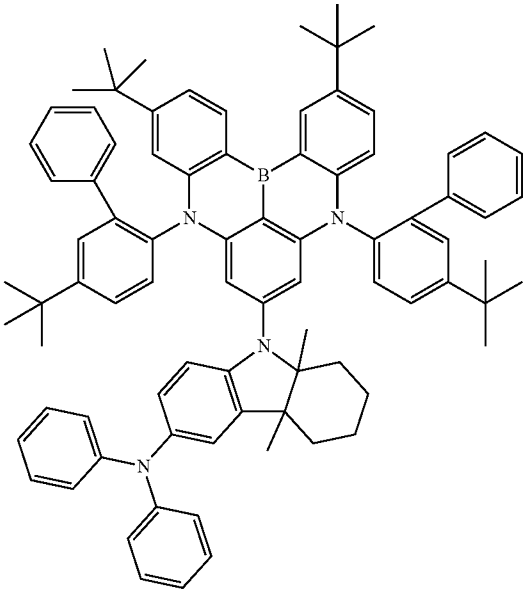
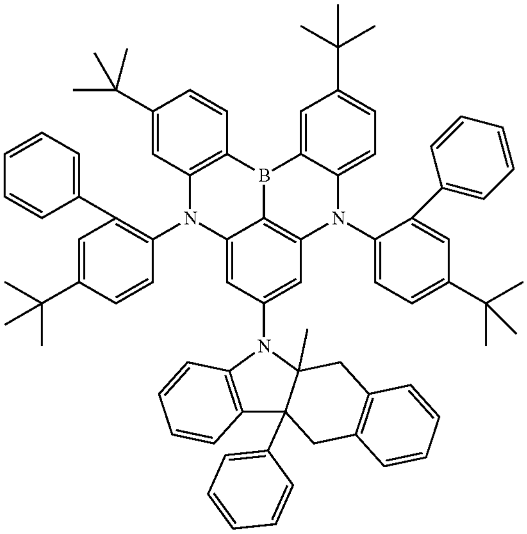
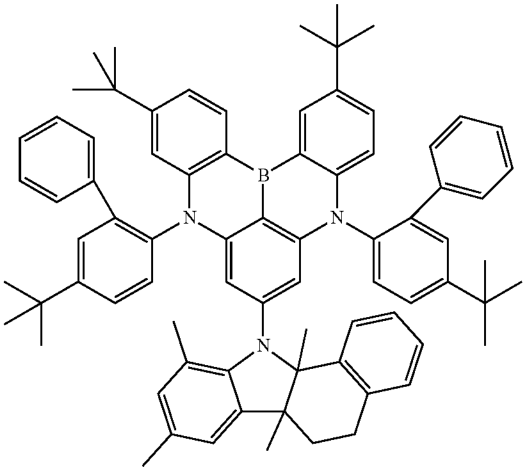
-continued
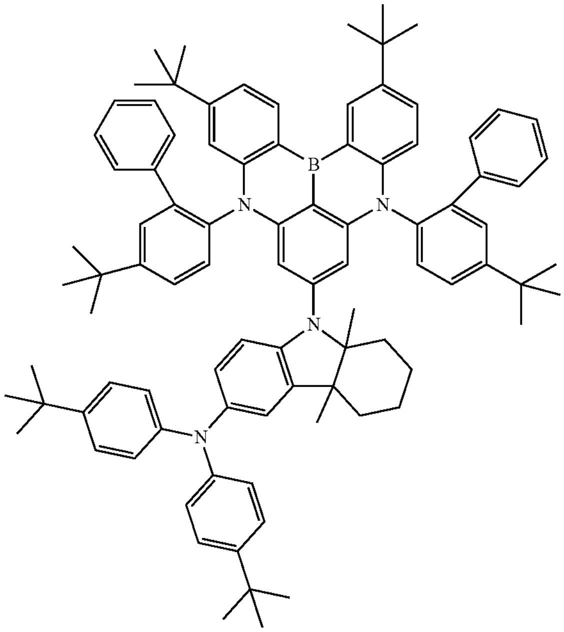
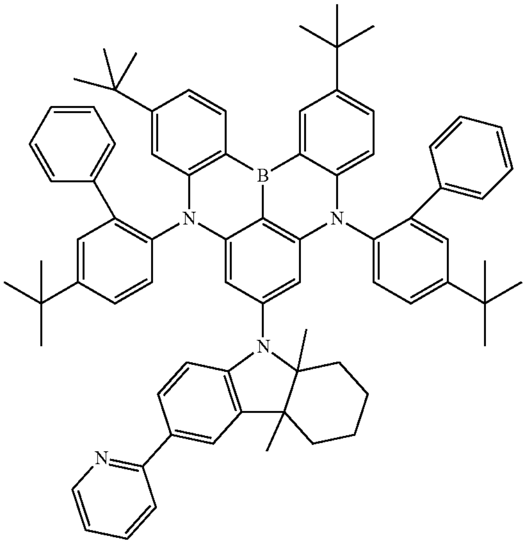
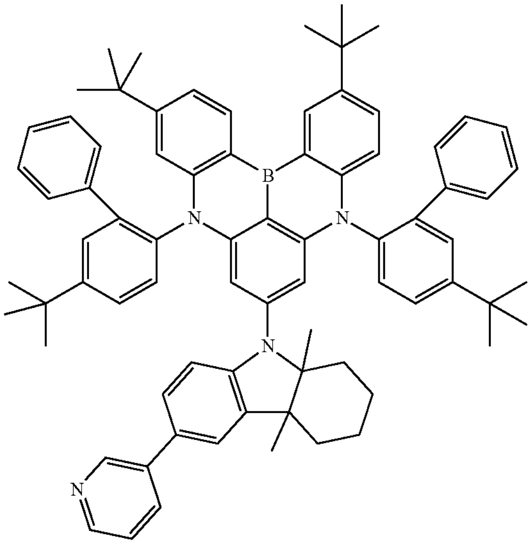

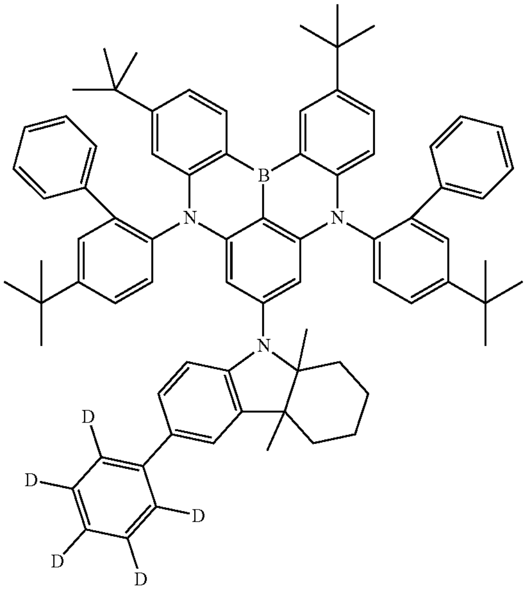
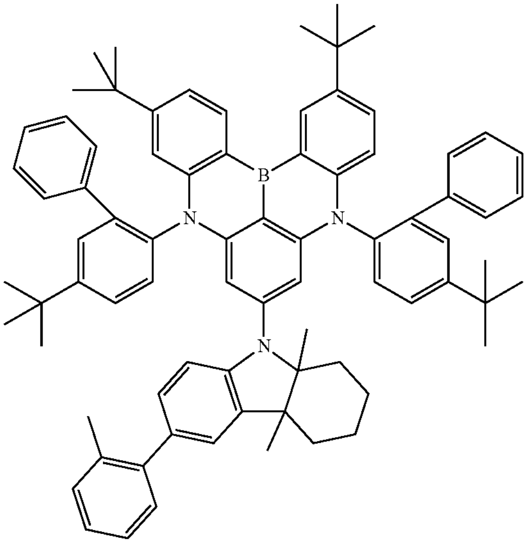
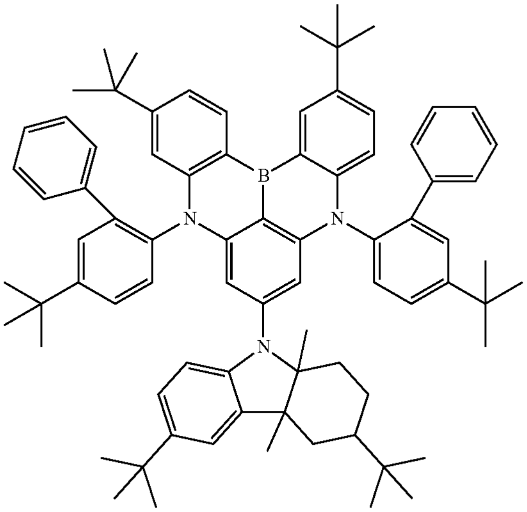
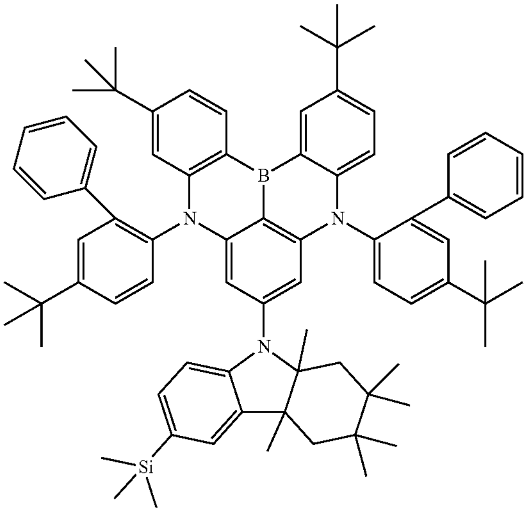
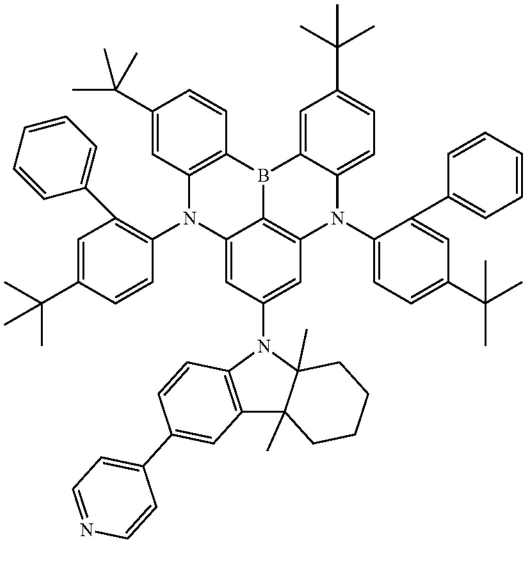
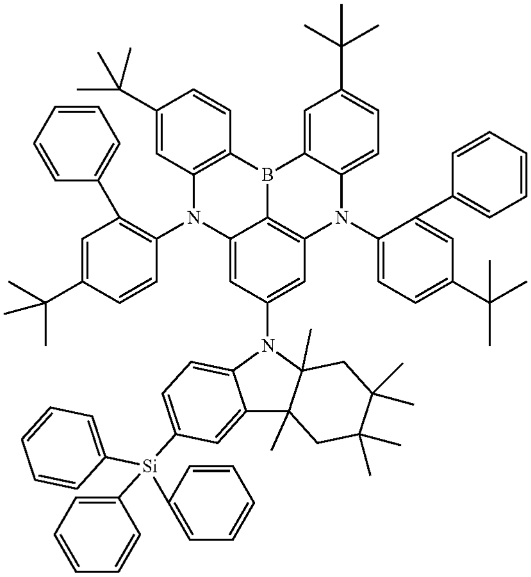

-continued
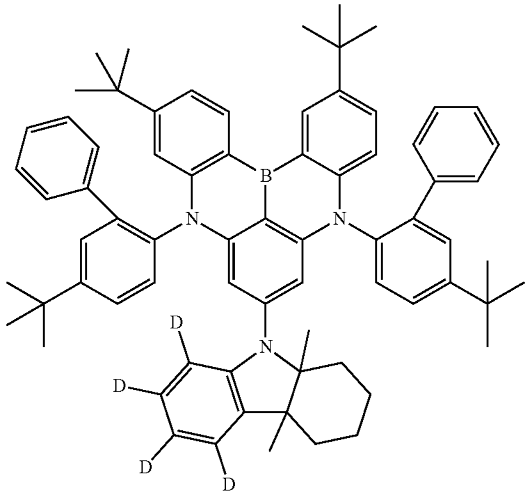
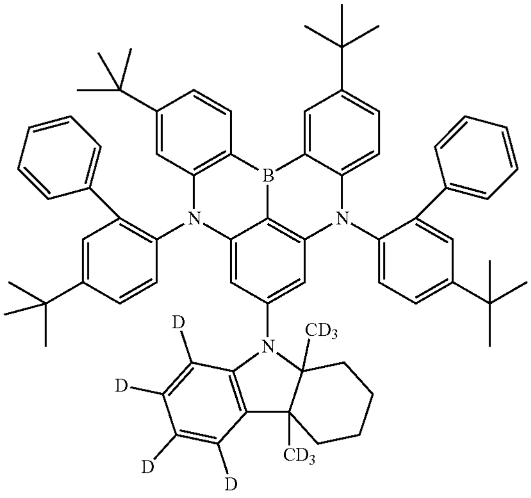
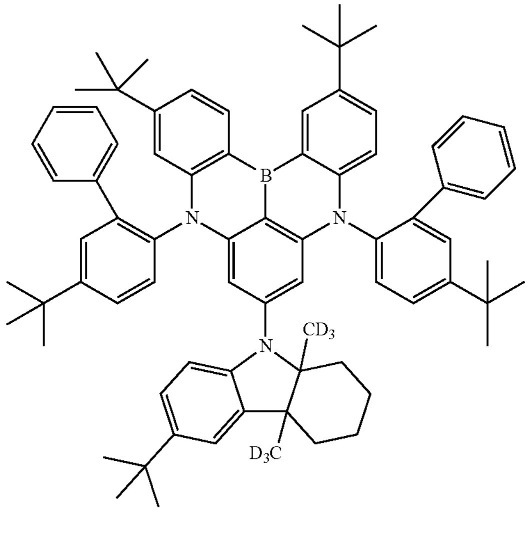
-continued
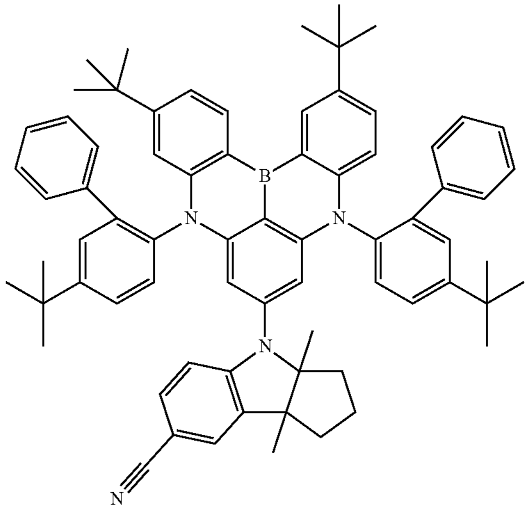
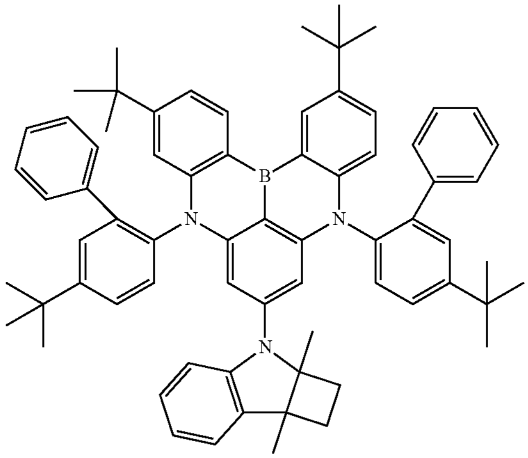
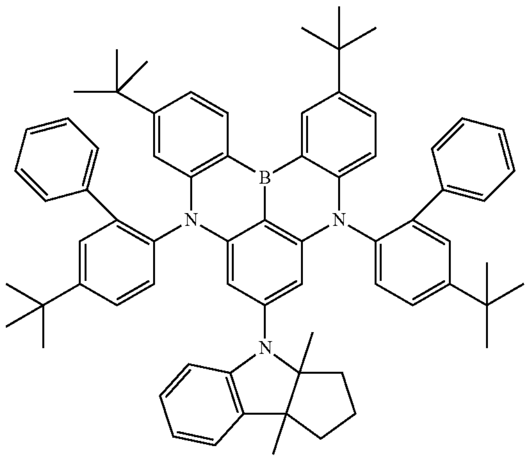

-continued
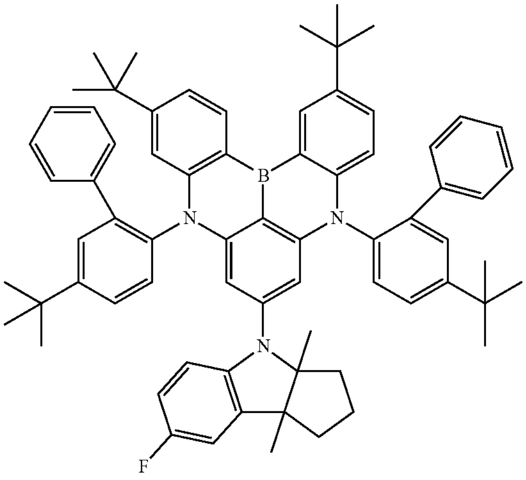
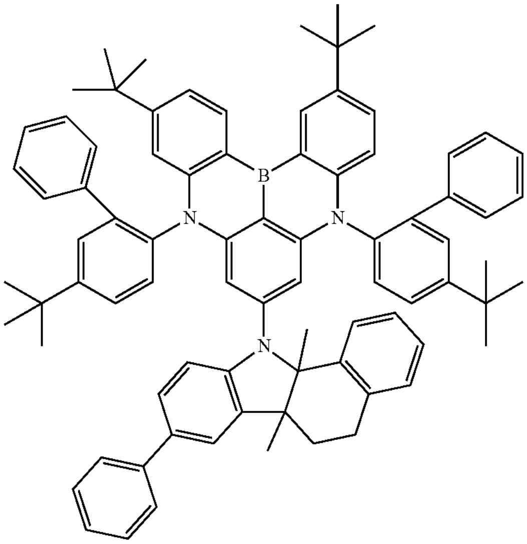
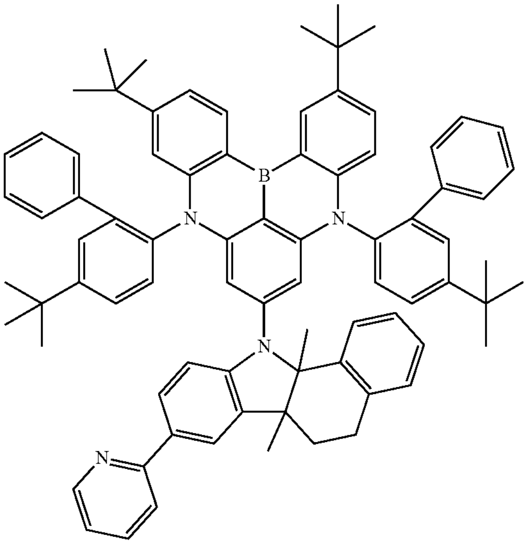
-continued
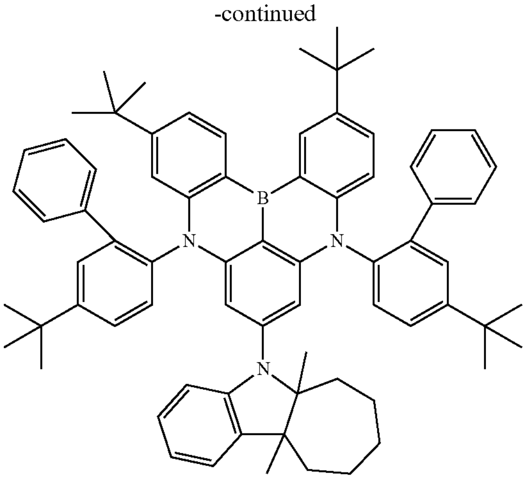
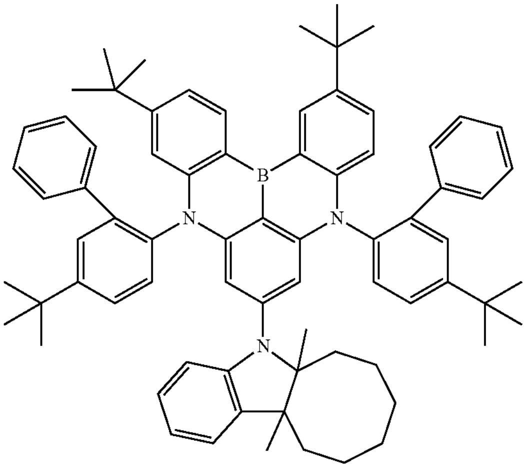 [SMILES: CC(C)(C)c1ccc2c(c1)B1c3ccc(C(C)(C)C)cc3N(c3ccc(C(C)(C)C)cc3-c3ccccc3)c3cc(N4c5ccccc5C5(C)CCCCCCC45C)cc(c31)N2c1ccc(C(C)(C)C)cc1-c1ccccc1]
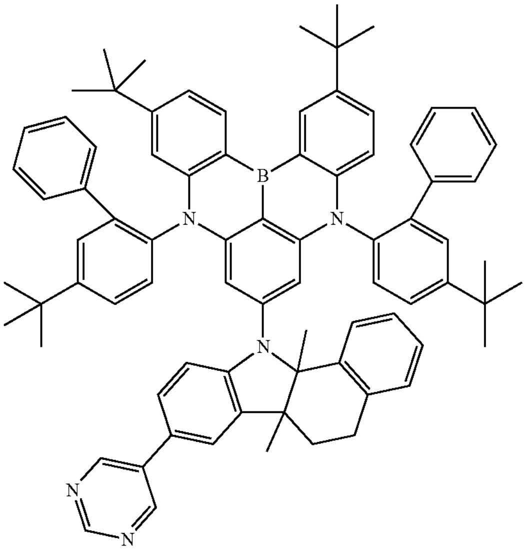

-continued
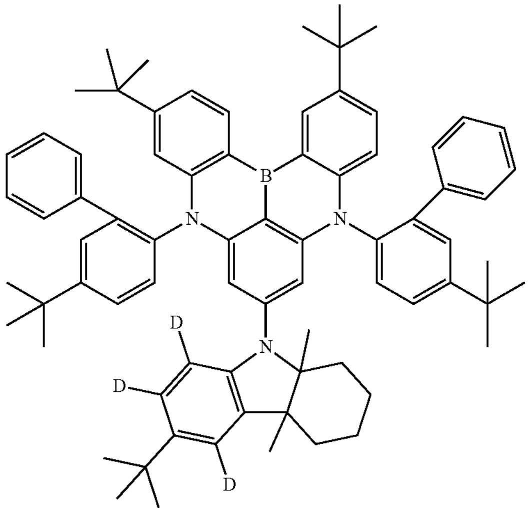
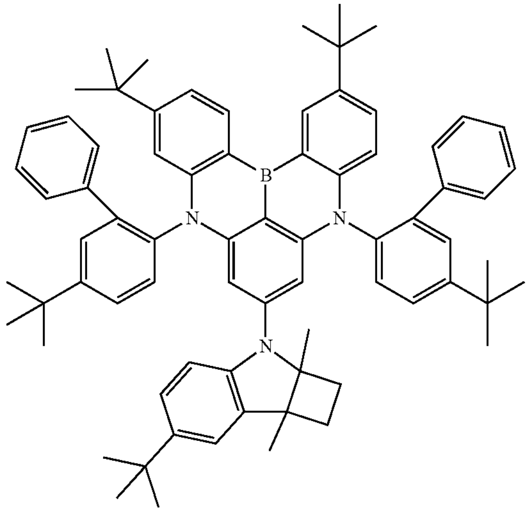
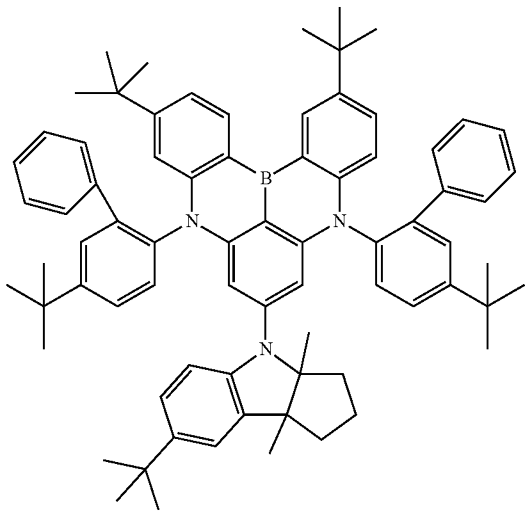 [SMILES: CC(C)(C)c1ccc2c(c1)B1c3ccc(C(C)(C)C)cc3N(c3ccc(C(C)(C)C)cc3-c3ccccc3)c3cc(N4c5ccc(C(C)(C)C)cc5C5(C)CCCC45C)cc(c31)N2c1ccc(C(C)(C)C)cc1-c1ccccc1]
-continued
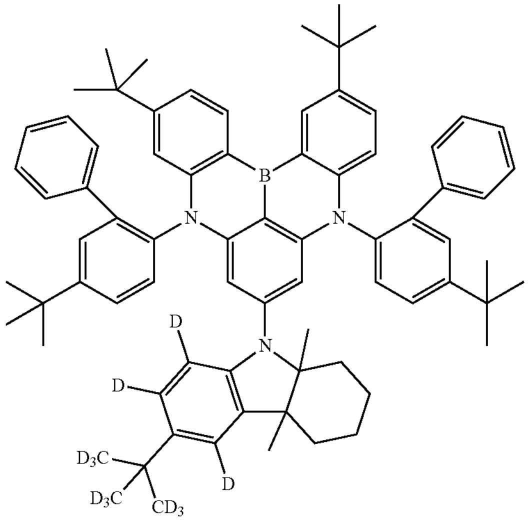
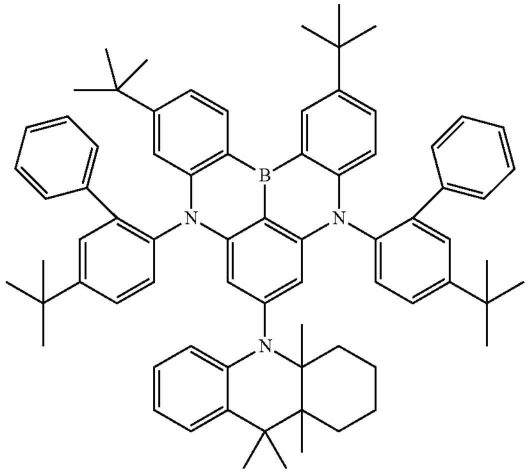
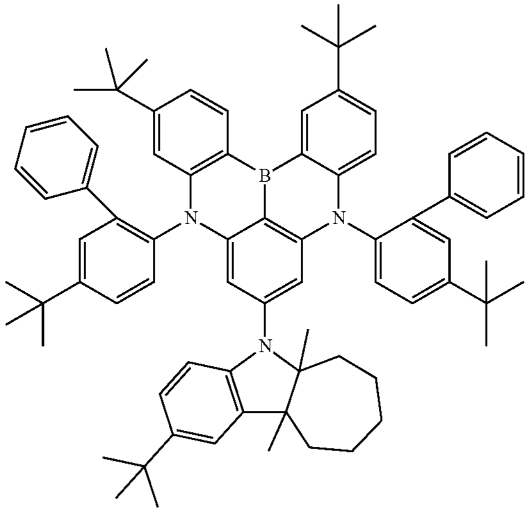

-continued
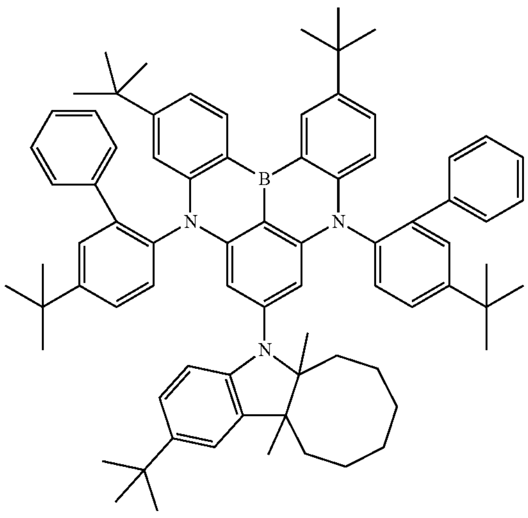 [SMILES: CC(C)(C)c1ccc2c(c1)B1c3ccc(C(C)(C)C)cc3N(c3ccc(C(C)(C)C)cc3-c3ccccc3)c3cc(N4c5ccc(C(C)(C)C)cc5C5(C)CCCCCCC45C)cc(c31)N2c1ccc(C(C)(C)C)cc1-c1ccccc1]
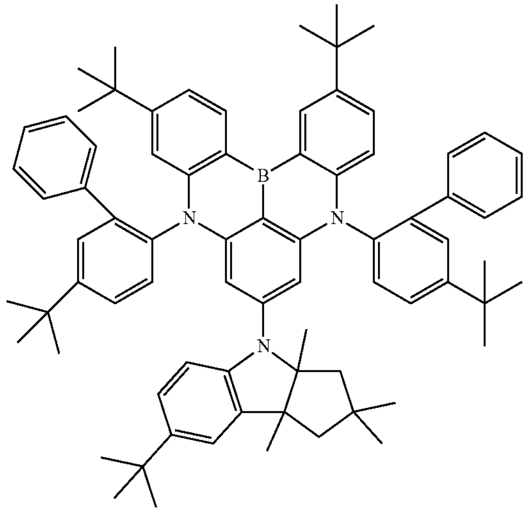
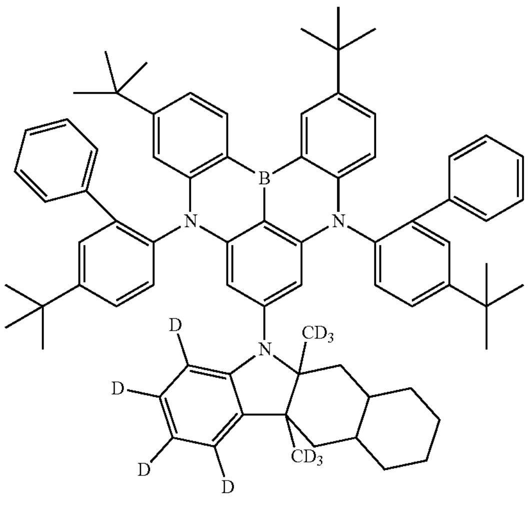
-continued
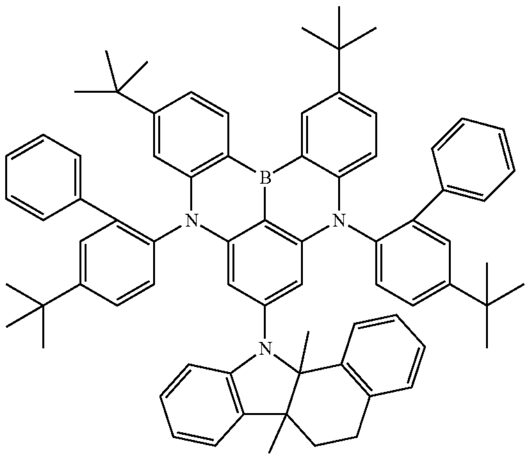
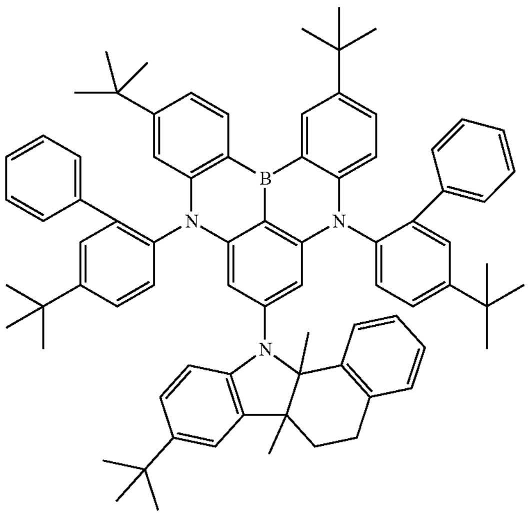 [SMILES: CC(C)(C)c1ccc2c(c1)B1c3ccc(C(C)(C)C)cc3N(c3ccc(C(C)(C)C)cc3-c3ccccc3)c3cc(N4c5ccc(C(C)(C)C)cc5C5(C)CCc6ccccc6C45C)cc(c31)N2c1ccc(C(C)(C)C)cc1-c1ccccc1]
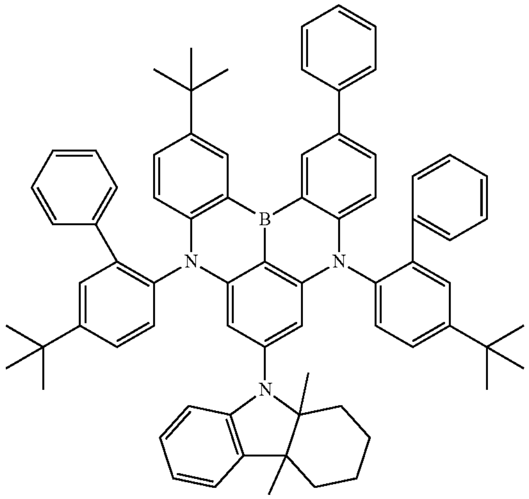

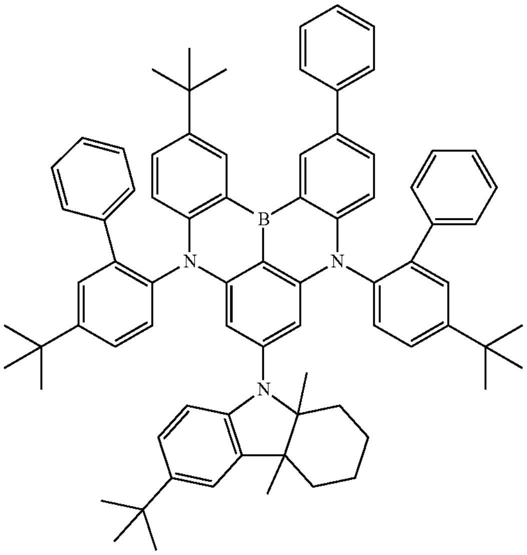
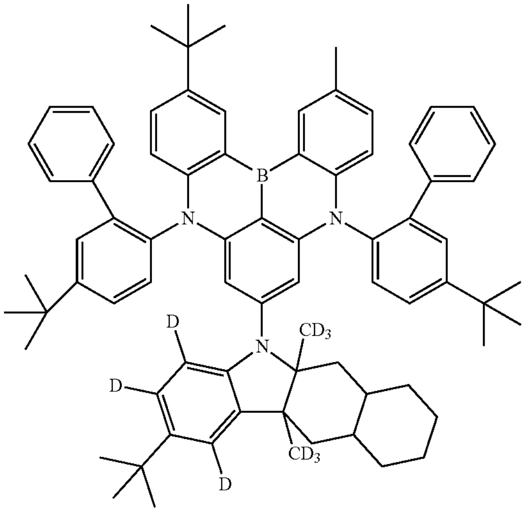
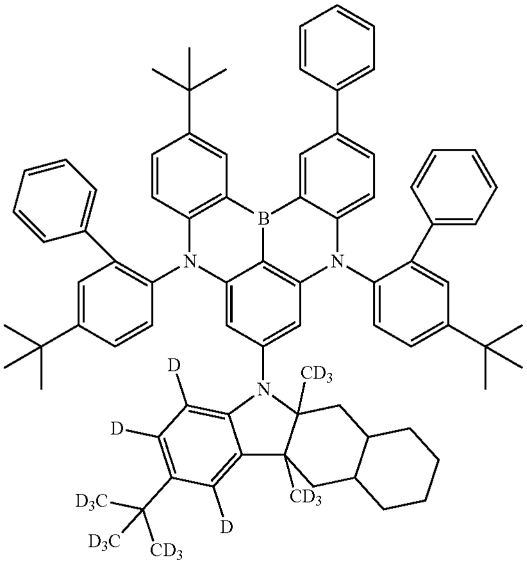 [SMILES: [2H]c1c([2H])c(C(C([2H])([2H])[2H])(C([2H])([2H])[2H])C([2H])([2H])[2H])c([2H])c2c1N(c1cc3c4c(c1)N(c1ccc(C(C)(C)C)cc1-c1ccccc1)c1ccc(C(C)(C)C)cc1B4c1cc(-c4ccccc4)ccc1N3c1ccc(C(C)(C)C)cc1-c1ccccc1)C1(C([2H])([2H])[2H])CC3CCCCC3CC21C([2H])([2H])[2H]]
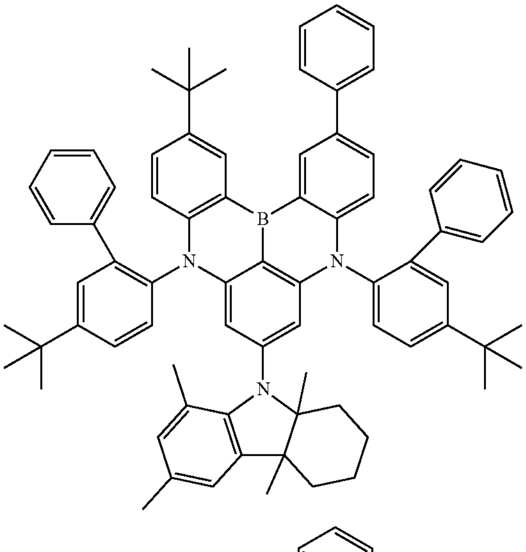
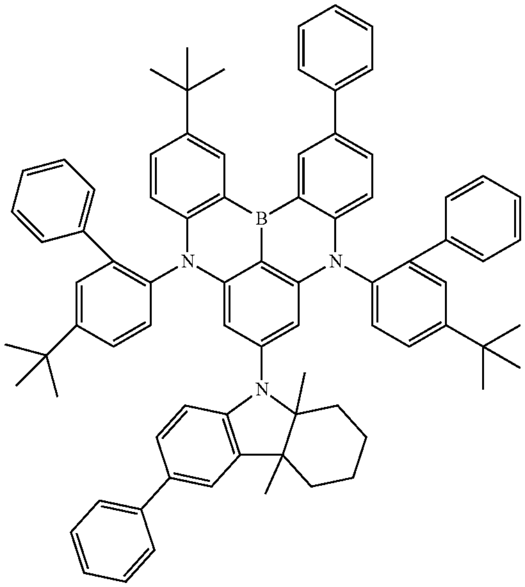
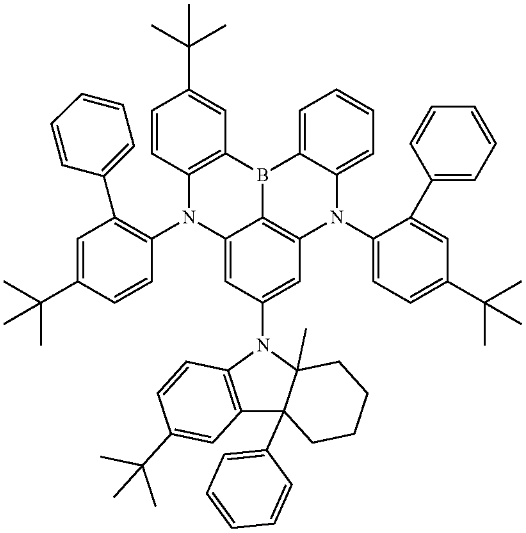

-continued
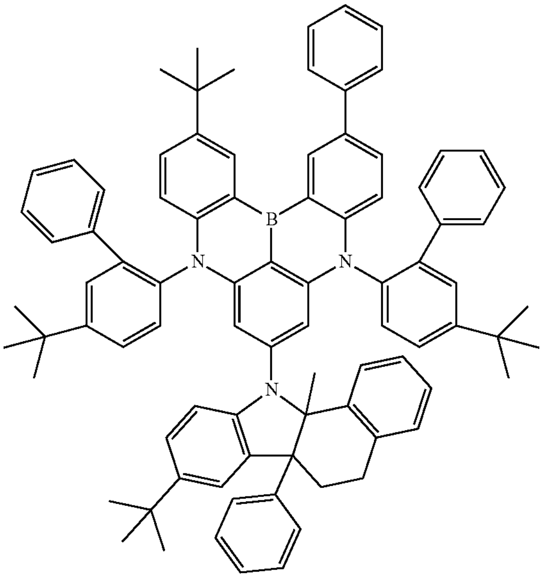 [SMILES: CC(C)(C)c1ccc2c(c1)B1c3cc(-c4ccccc4)ccc3N(c3ccc(C(C)(C)C)cc3-c3ccccc3)c3cc(N4c5ccc(C(C)(C)C)cc5C5(c6ccccc6)CCc6ccccc6C45C)cc(c31)N2c1ccc(C(C)(C)C)cc1-c1ccccc1]
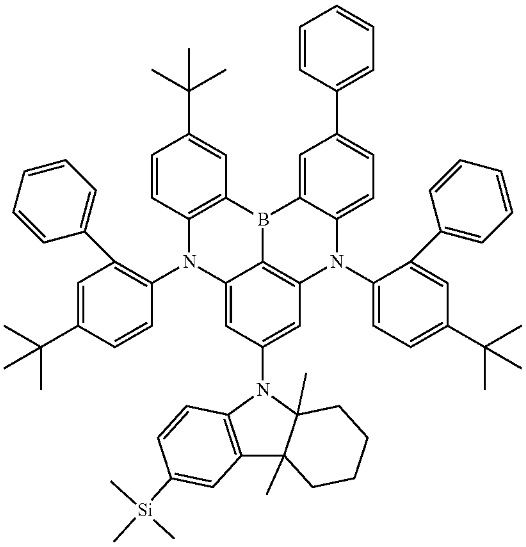
-continued
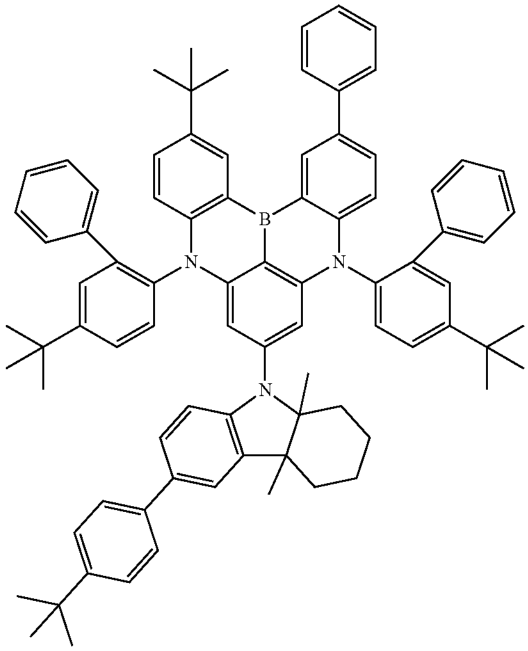
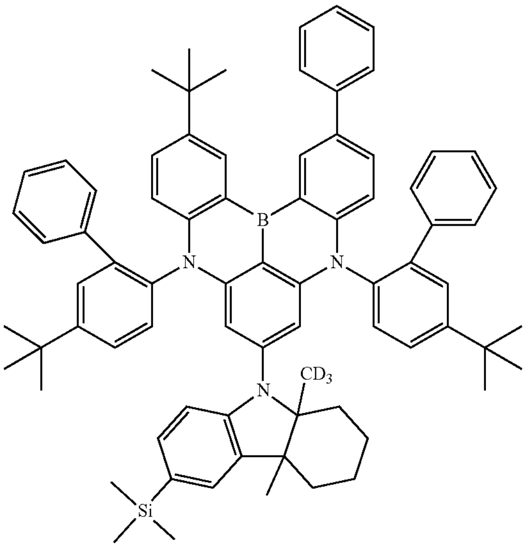

-continued
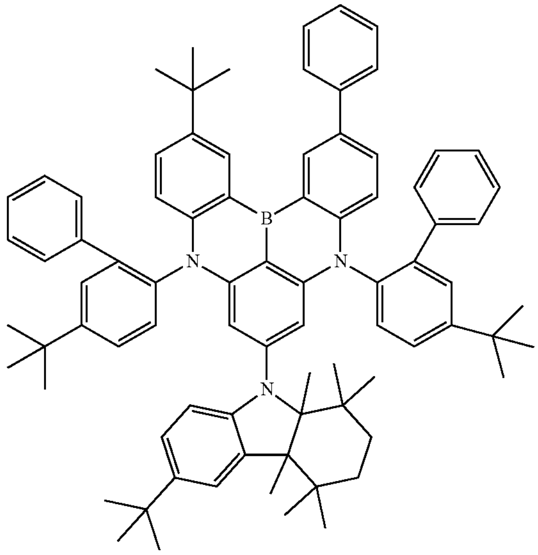 [SMILES: CC(C)(C)c1ccc2c(c1)B1c3cc(-c4ccccc4)ccc3N(c3ccc(C(C)(C)C)cc3-c3ccccc3)c3cc(N4c5ccc(C(C)(C)C)cc5C5(C)C(C)(C)CCC(C)(C)C45C)cc(c31)N2c1ccc(C(C)(C)C)cc1-c1ccccc1]
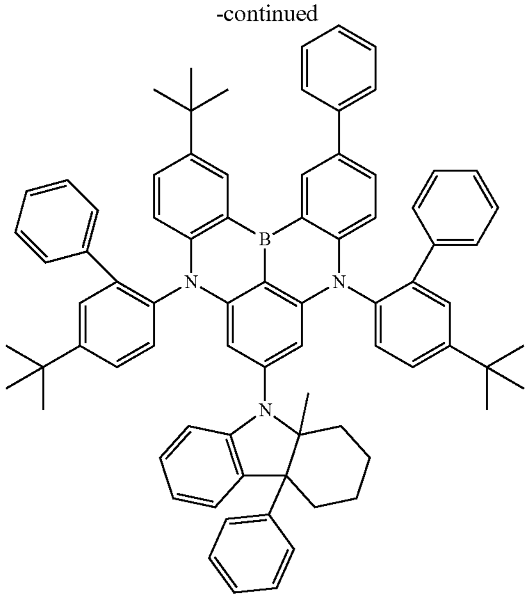
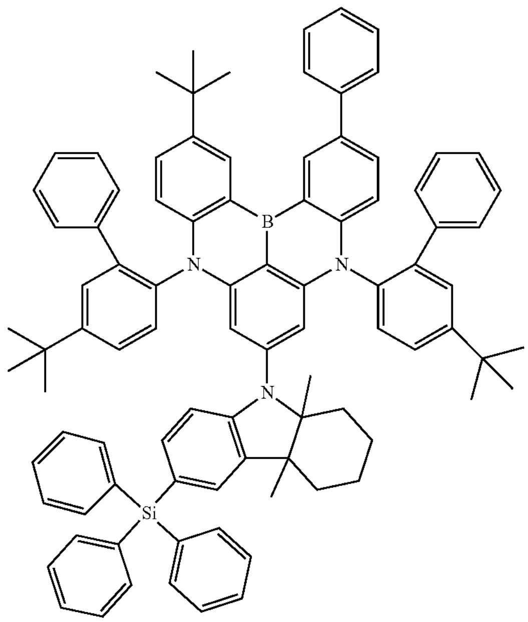
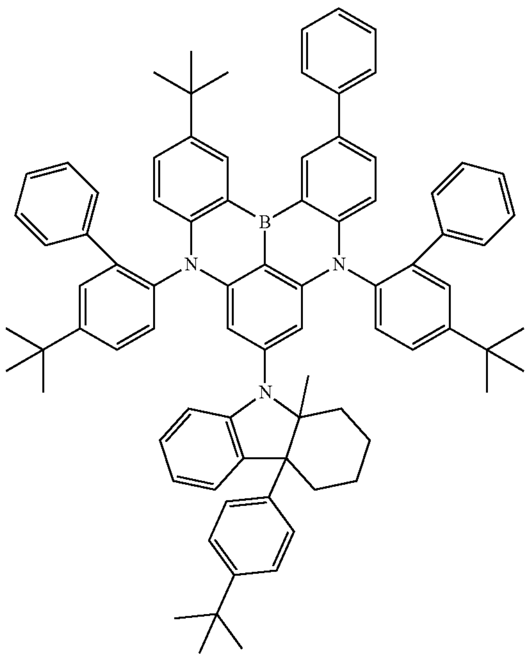
-continued

-continued
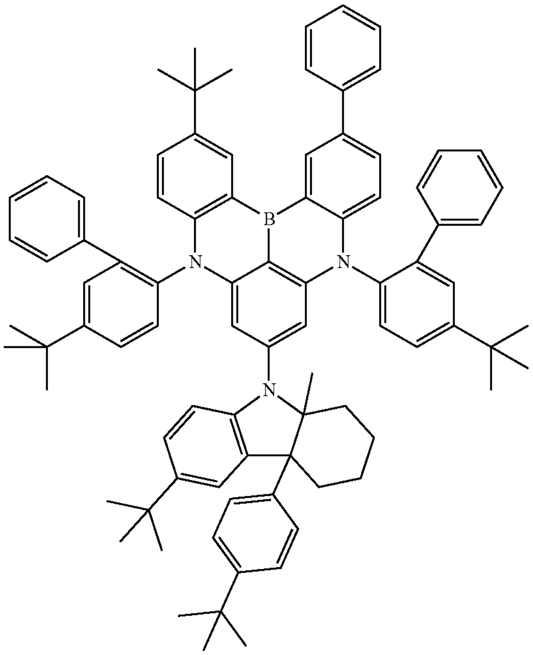
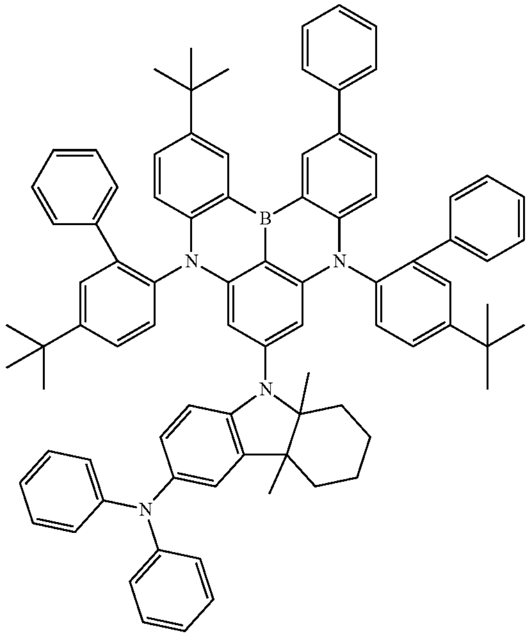
-continued
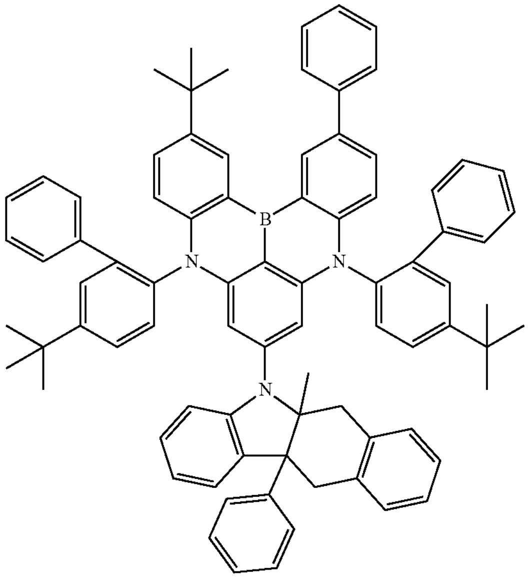
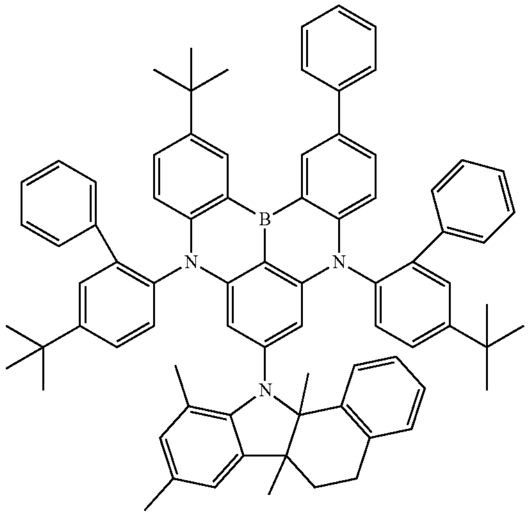

-continued
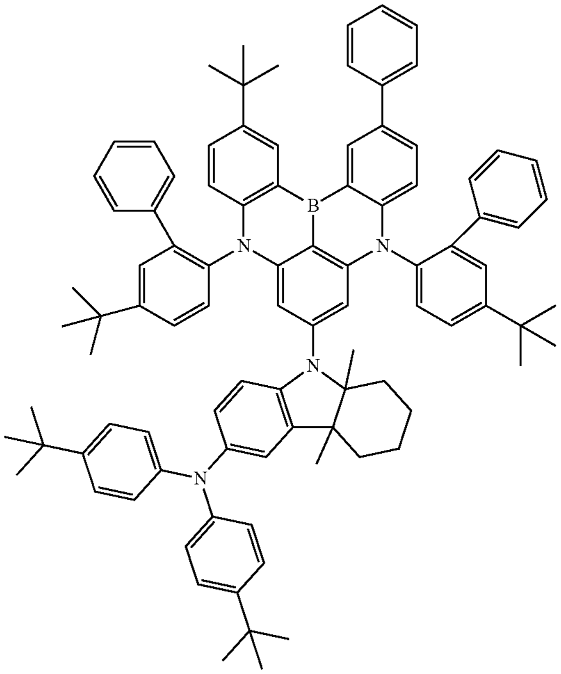
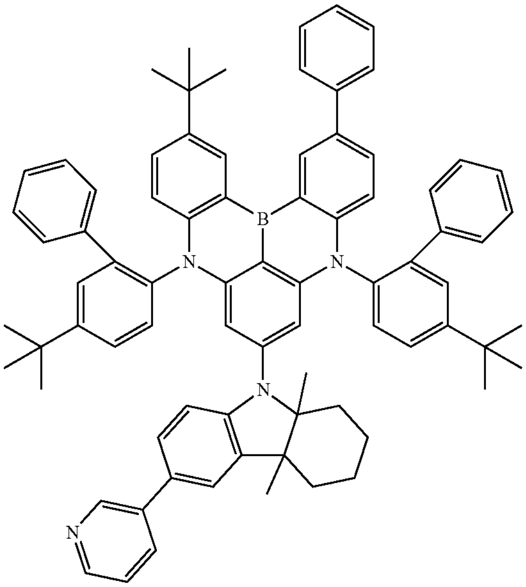
-continued
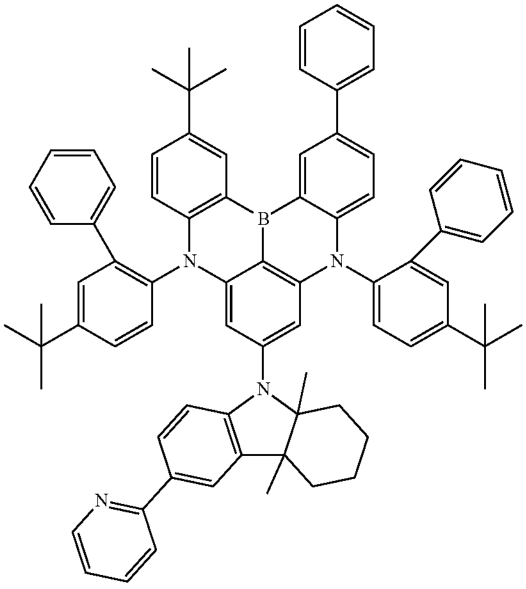
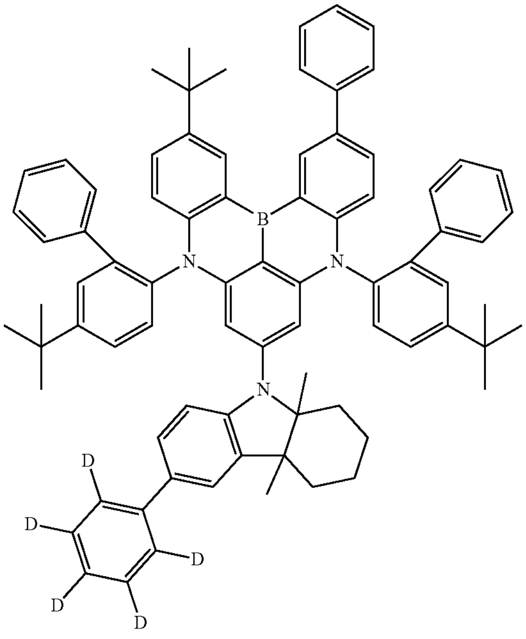

-continued
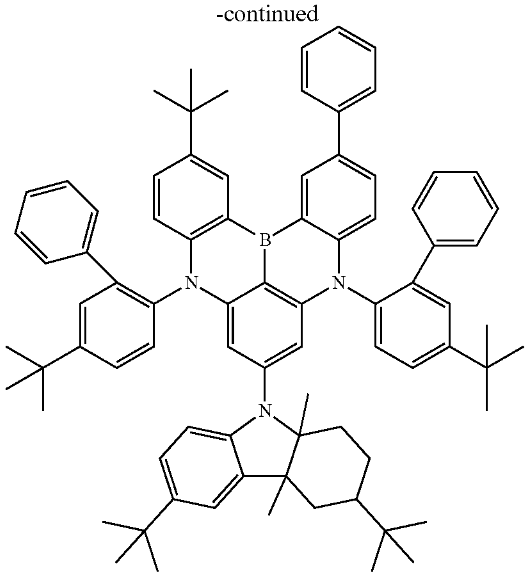
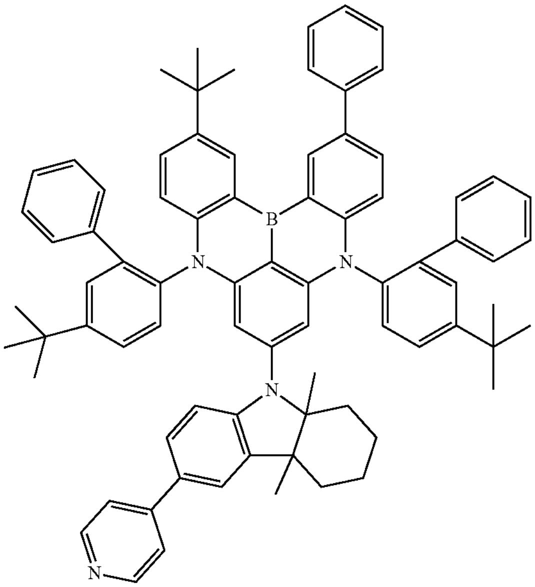
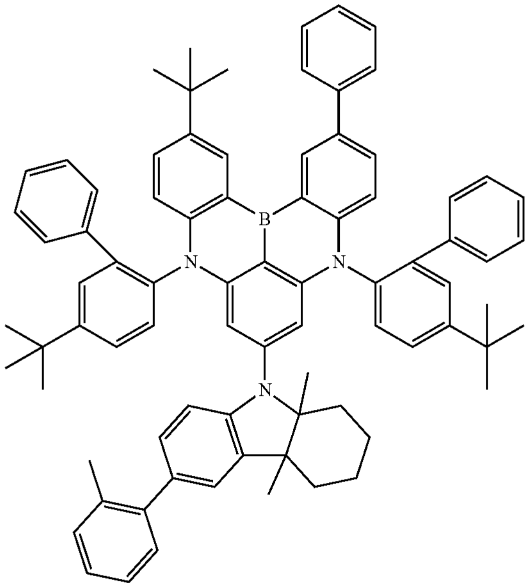
-continued
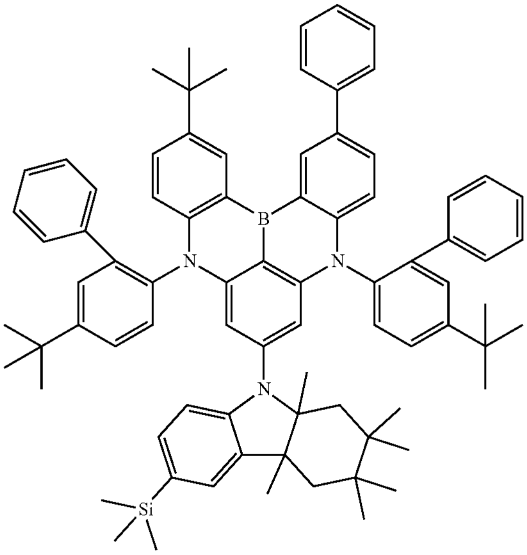
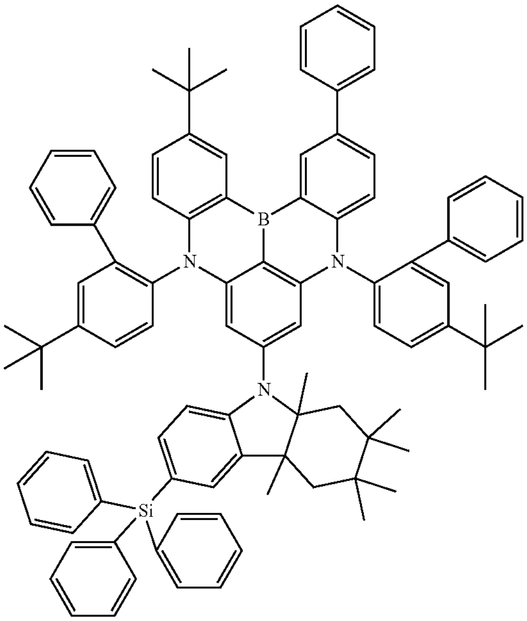
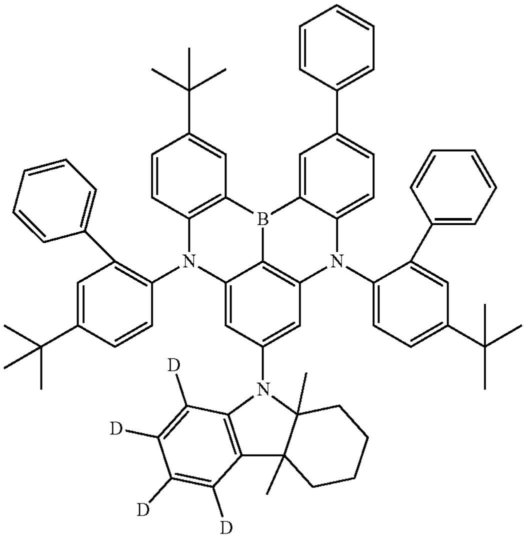

-continued
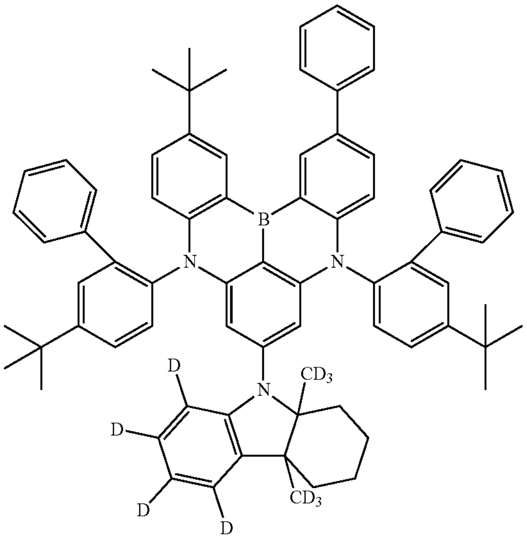
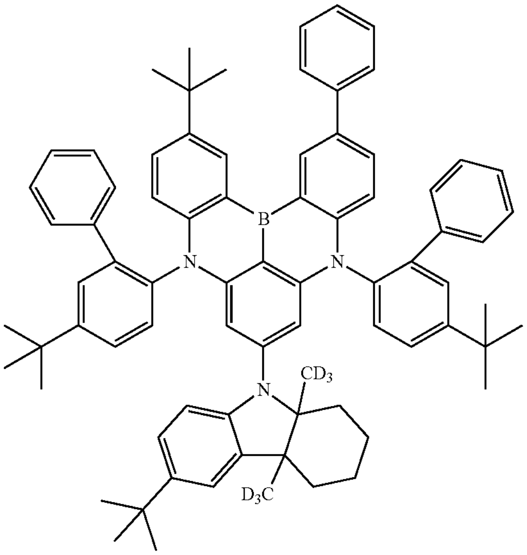
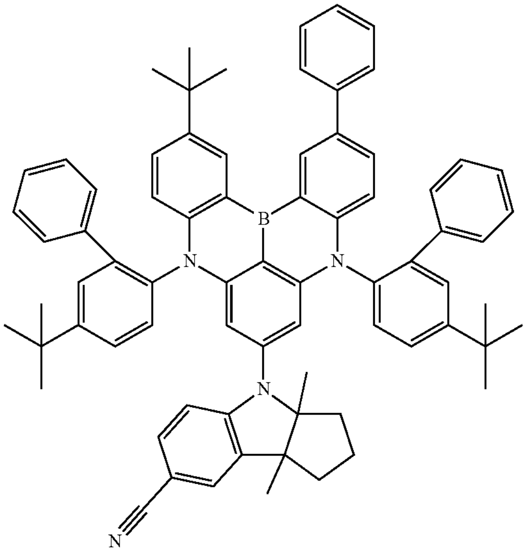 [SMILES: CC(C)(C)c1ccc2c(c1)B1c3cc(-c4ccccc4)ccc3N(c3ccc(C(C)(C)C)cc3-c3ccccc3)c3cc(N4c5ccc(C#N)cc5C5(C)CCCC45C)cc(c31)N2c1ccc(C(C)(C)C)cc1-c1ccccc1]
-continued
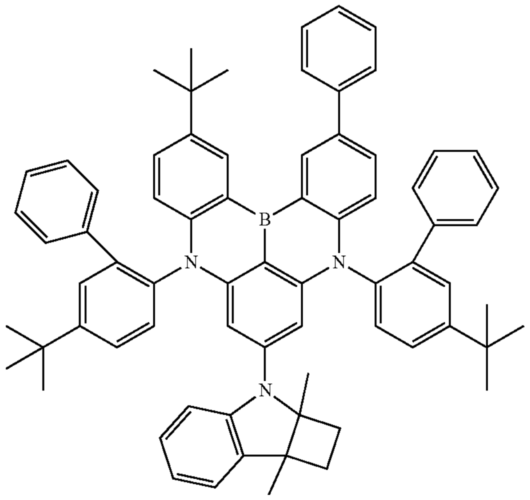
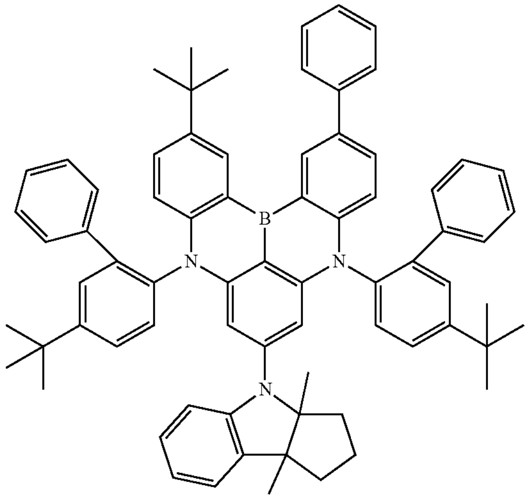
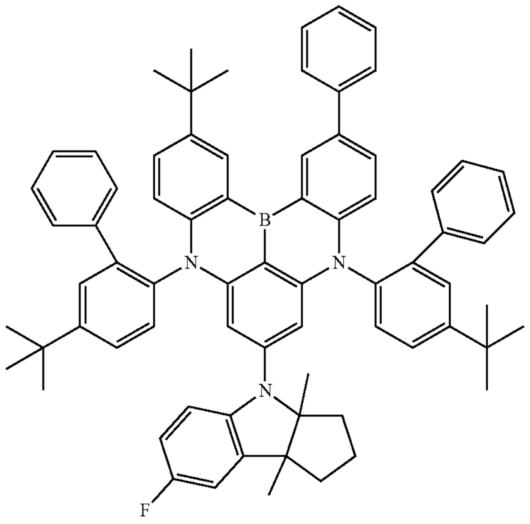

-continued
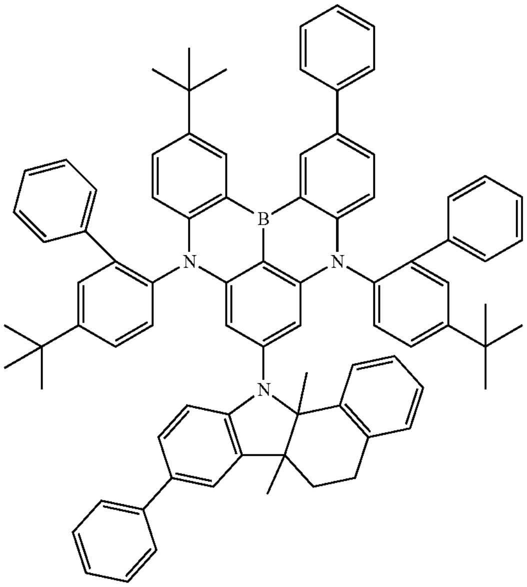
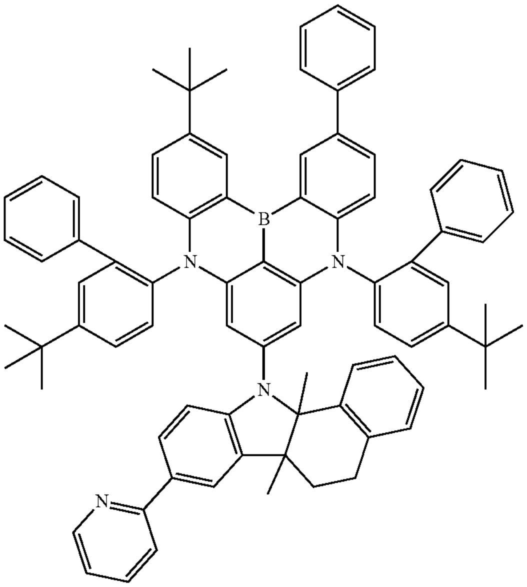
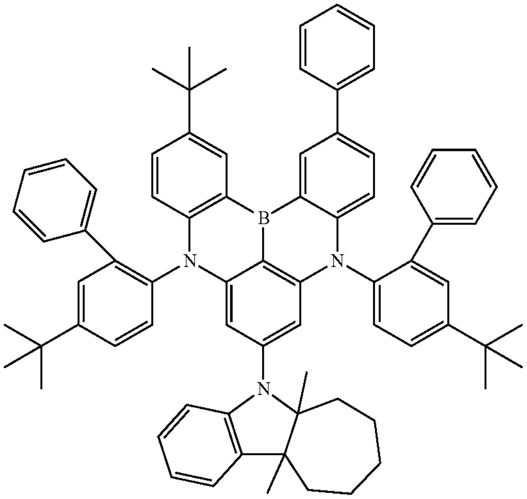
-continued
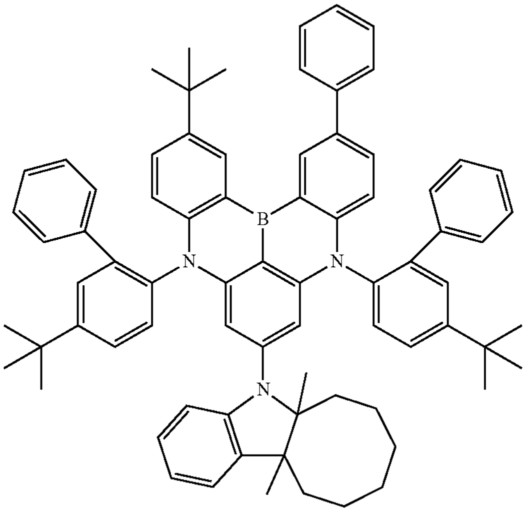 [SMILES: CC(C)(C)c1ccc2c(c1)B1c3cc(-c4ccccc4)ccc3N(c3ccc(C(C)(C)C)cc3-c3ccccc3)c3cc(N4c5ccccc5C5(C)CCCCCCC45C)cc(c31)N2c1ccc(C(C)(C)C)cc1-c1ccccc1]
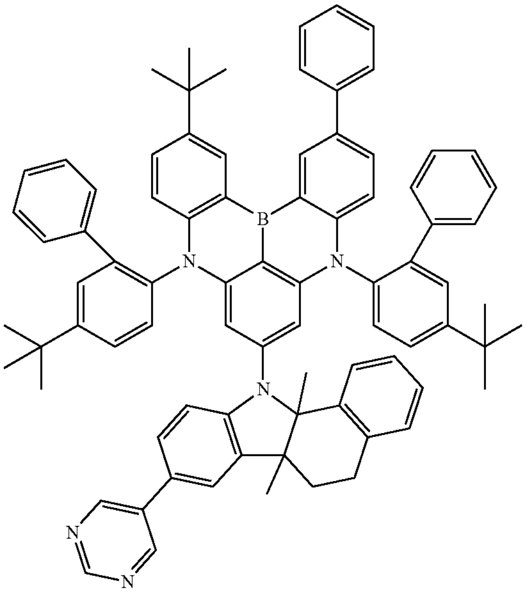
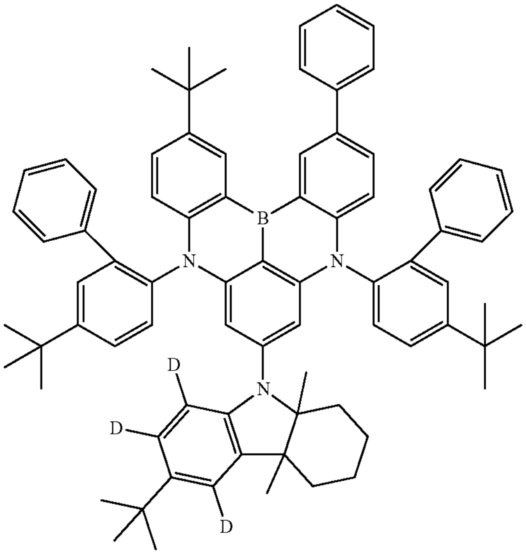

-continued
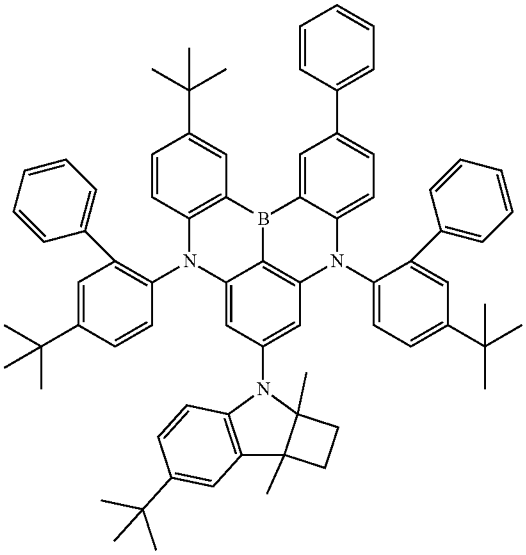
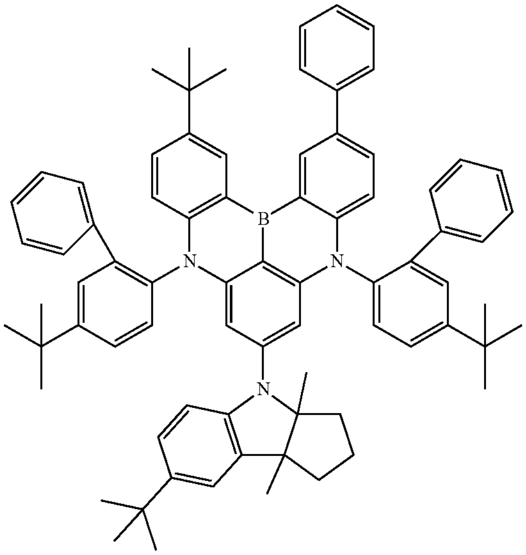 [SMILES: CC(C)(C)c1ccc2c(c1)B1c3cc(-c4ccccc4)ccc3N(c3ccc(C(C)(C)C)cc3-c3ccccc3)c3cc(N4c5ccc(C(C)(C)C)cc5C5(C)CCCC45C)cc(c31)N2c1ccc(C(C)(C)C)cc1-c1ccccc1]
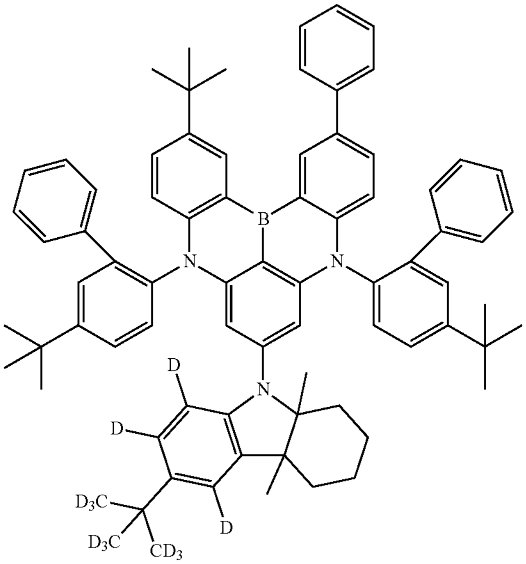
-continued
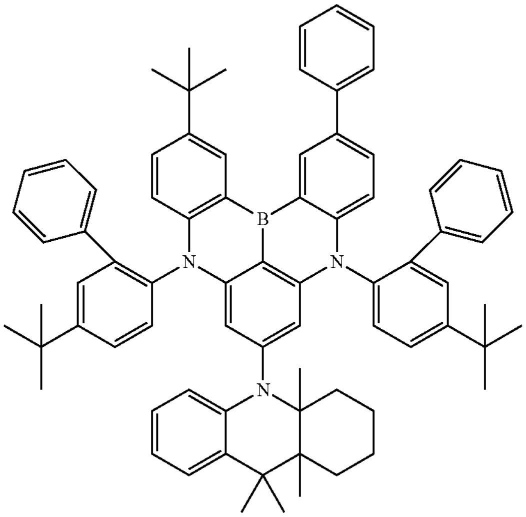
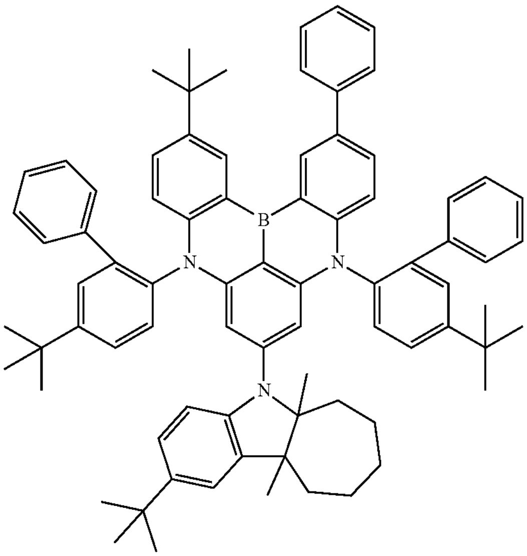
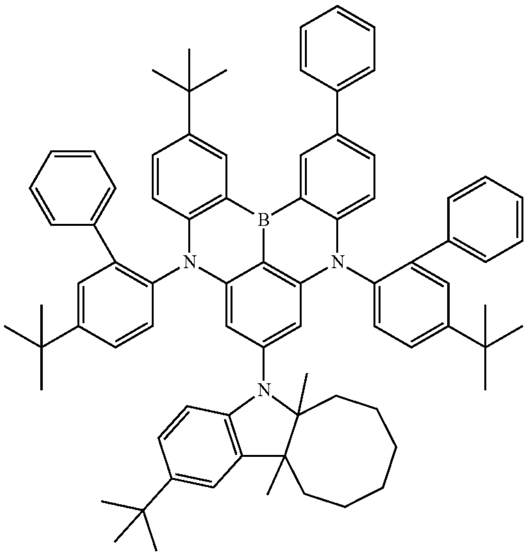 [SMILES: CC(C)(C)c1ccc2c(c1)B1c3cc(-c4ccccc4)ccc3N(c3ccc(C(C)(C)C)cc3-c3ccccc3)c3cc(N4c5ccc(C(C)(C)C)cc5C5(C)CCCCCCC45C)cc(c31)N2c1ccc(C(C)(C)C)cc1-c1ccccc1]

-continued
-continued
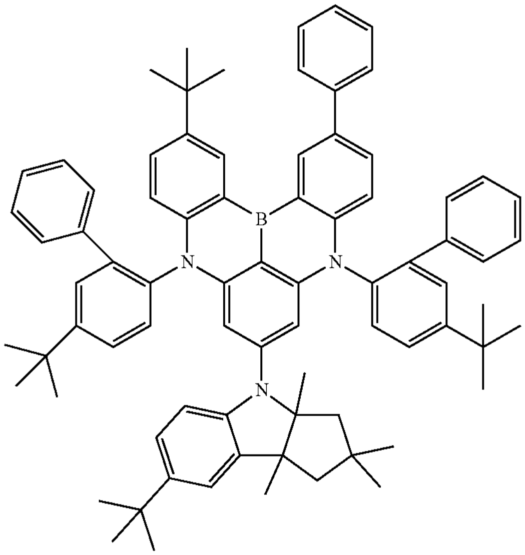
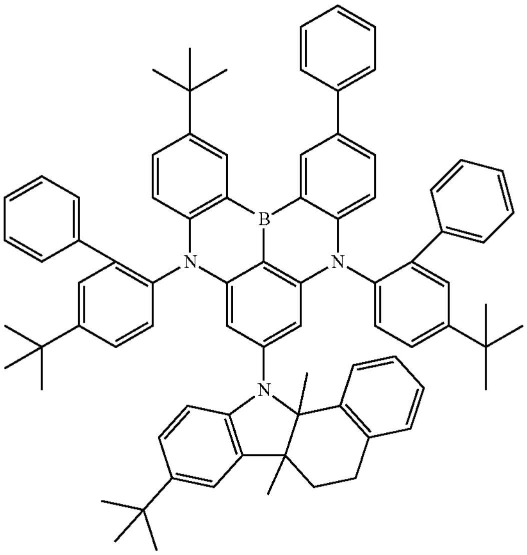
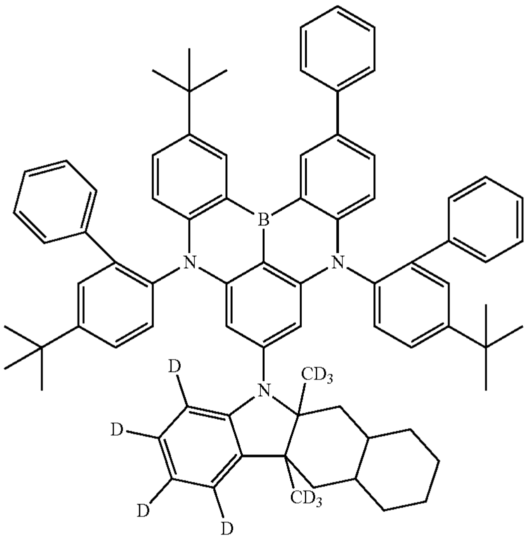
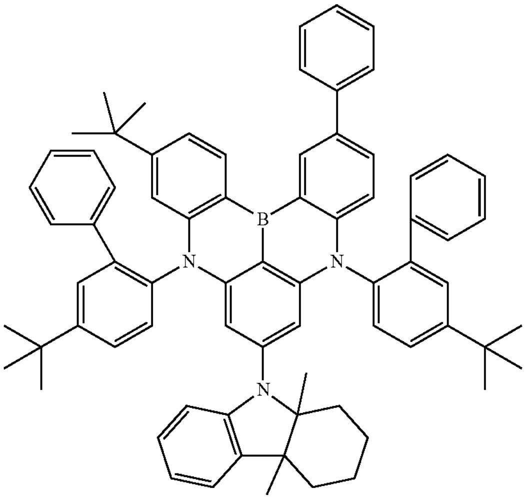
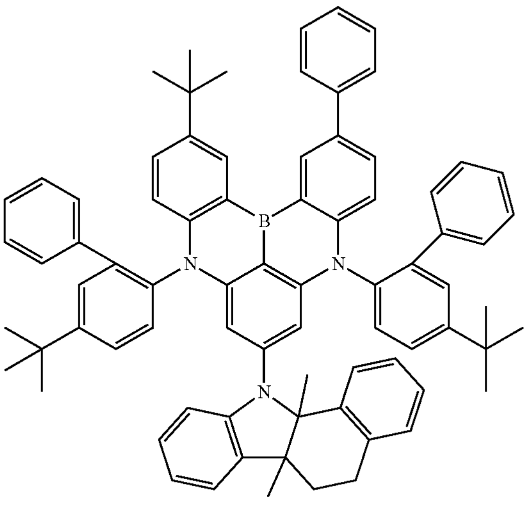
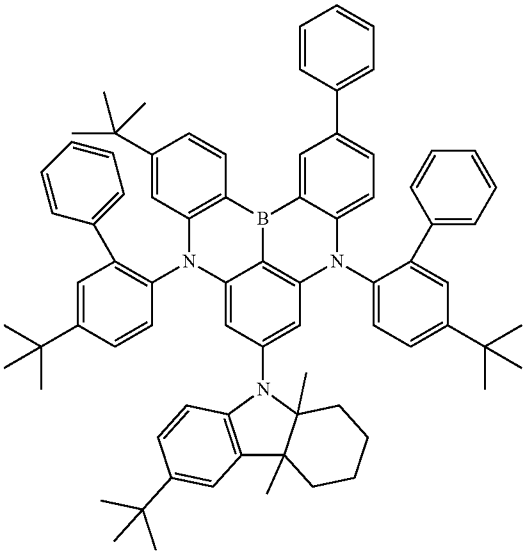

-continued
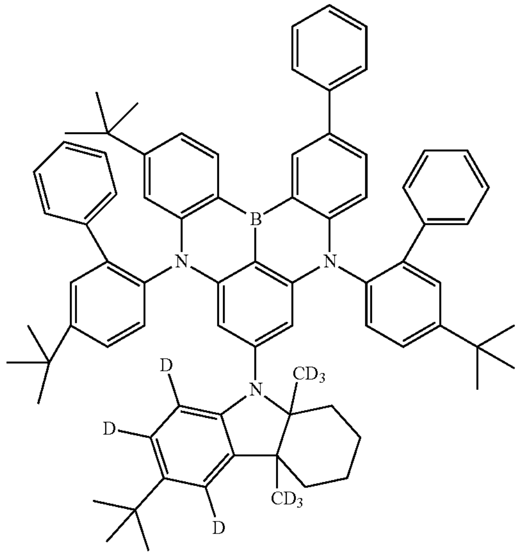
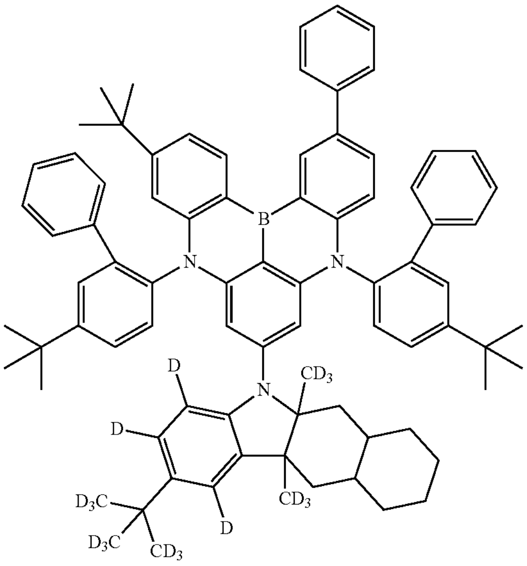
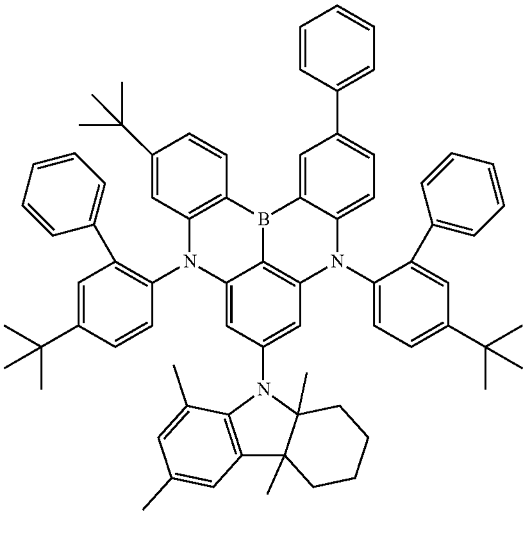
-continued
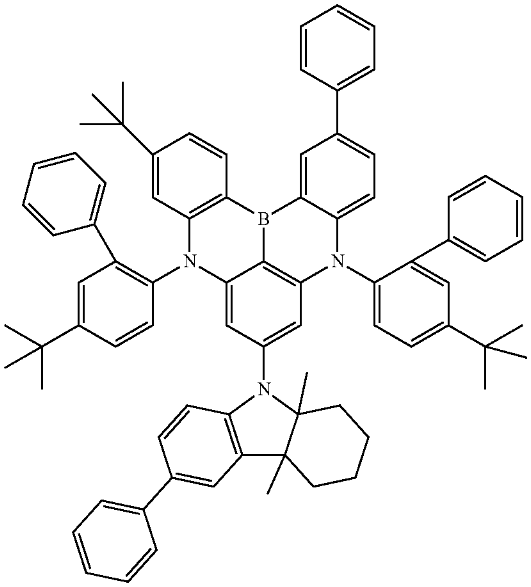
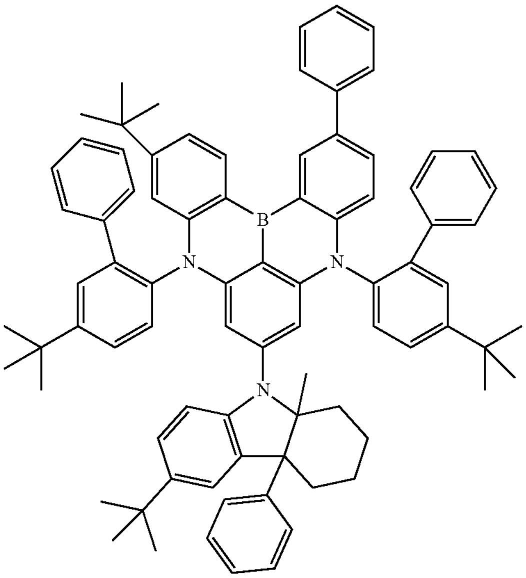

-continued
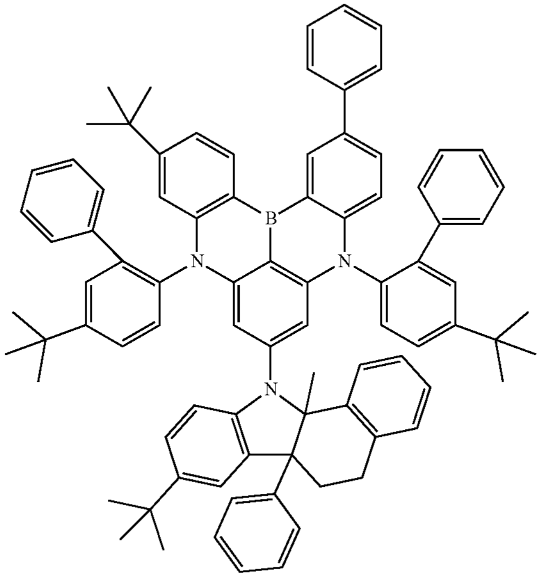
-continued
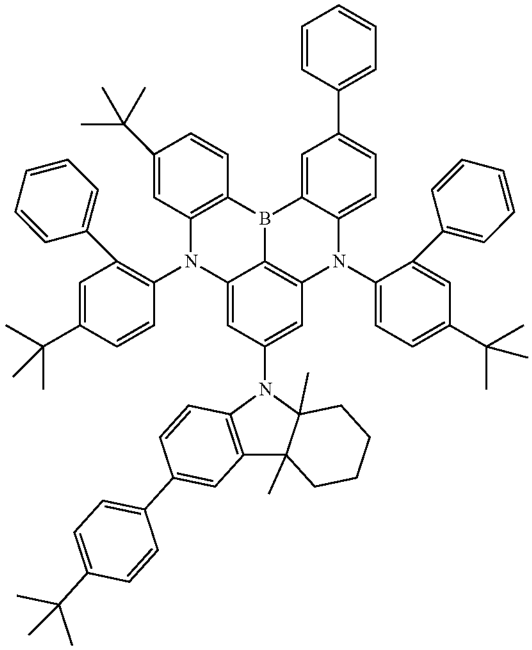
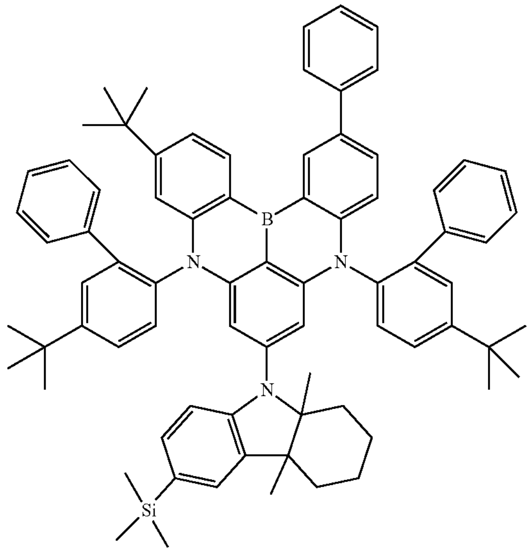
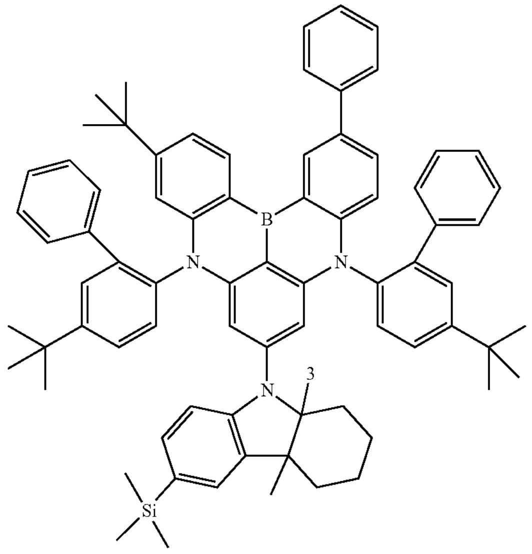

-continued
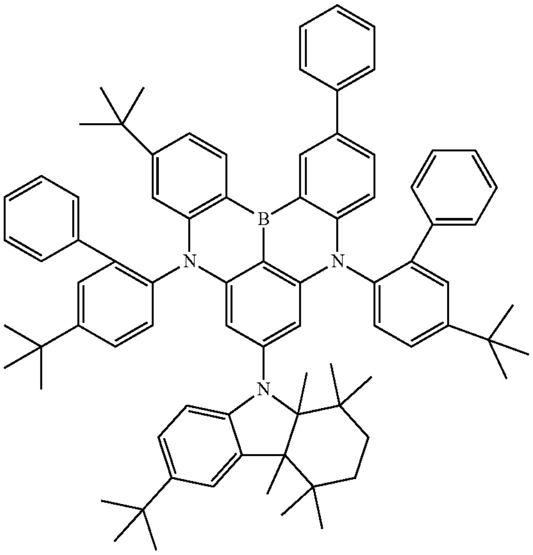
-continued
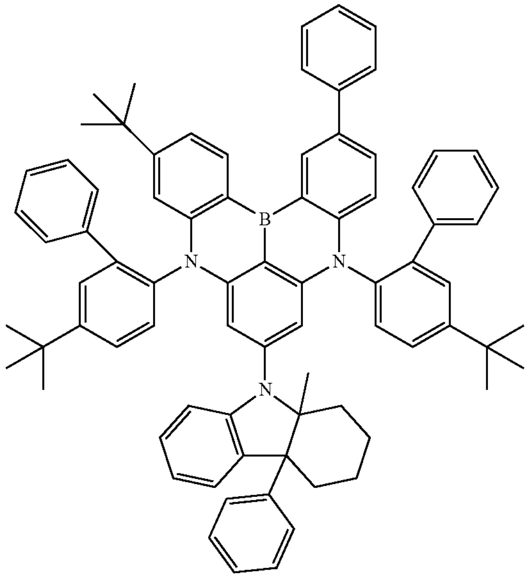
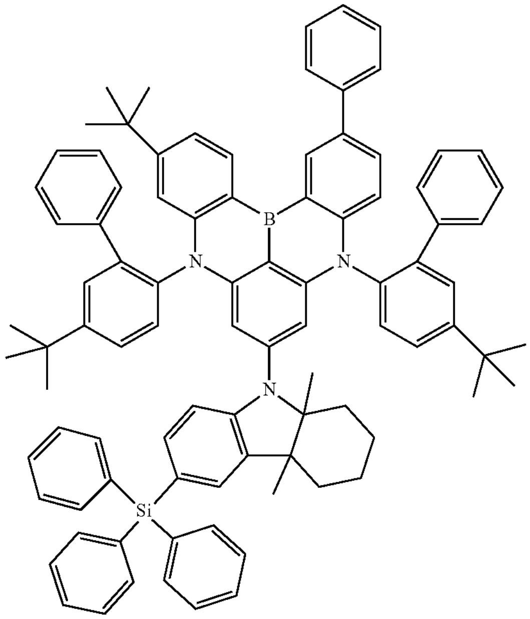
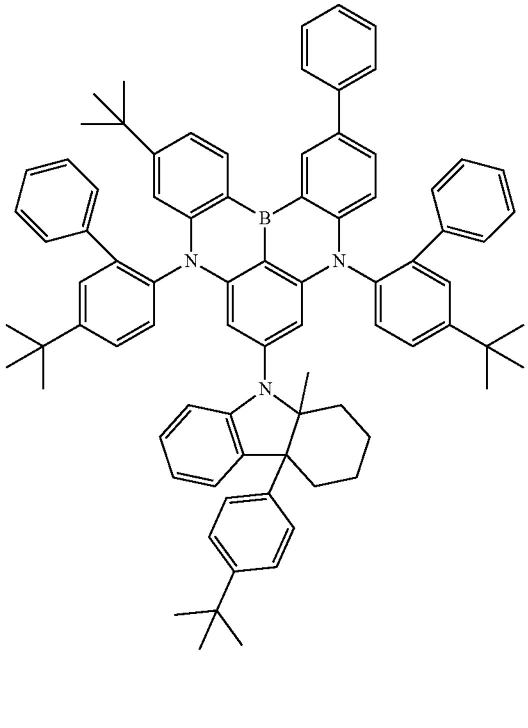

-continued
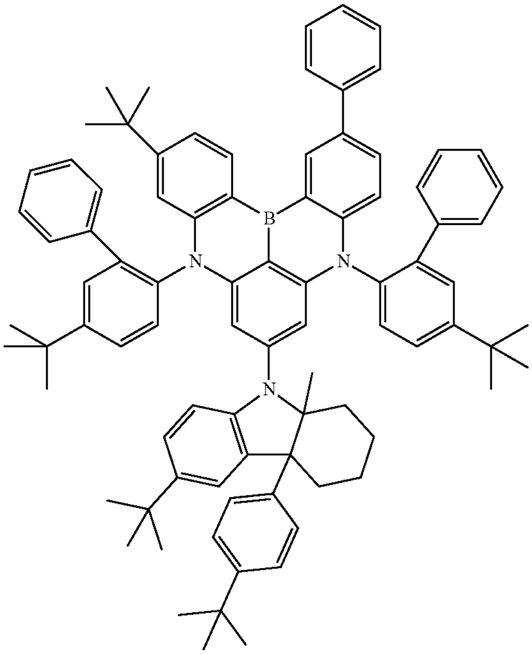
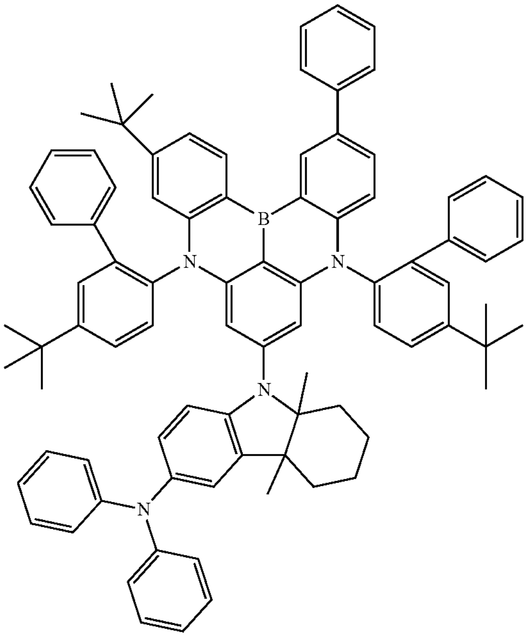
-continued
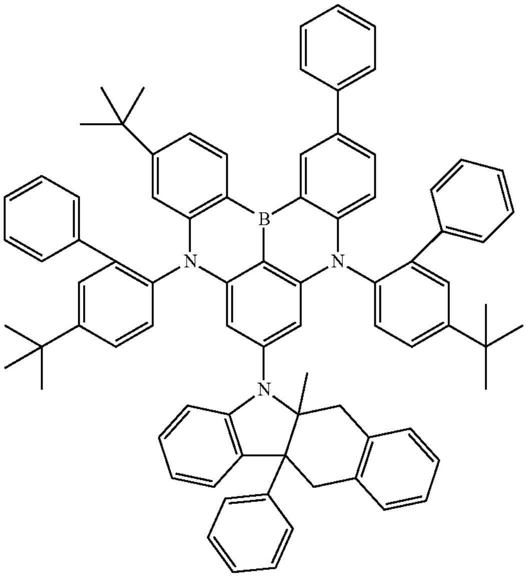
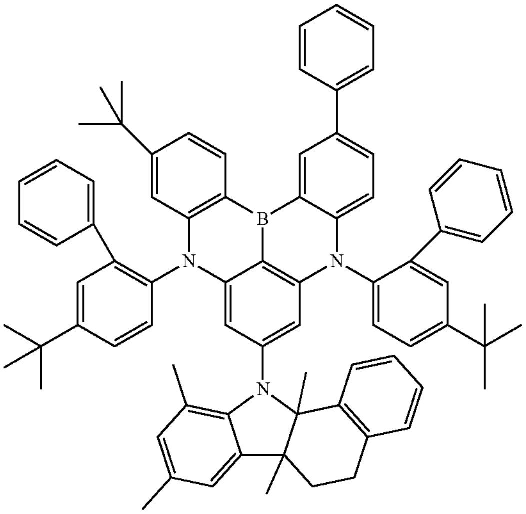

-continued
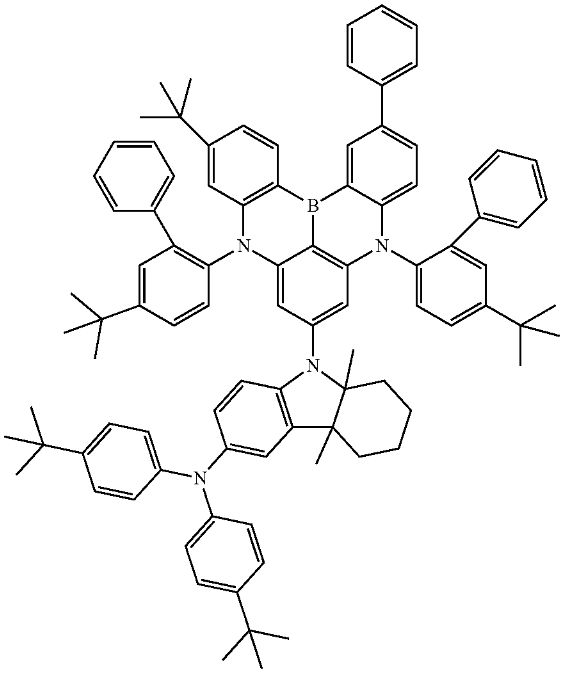
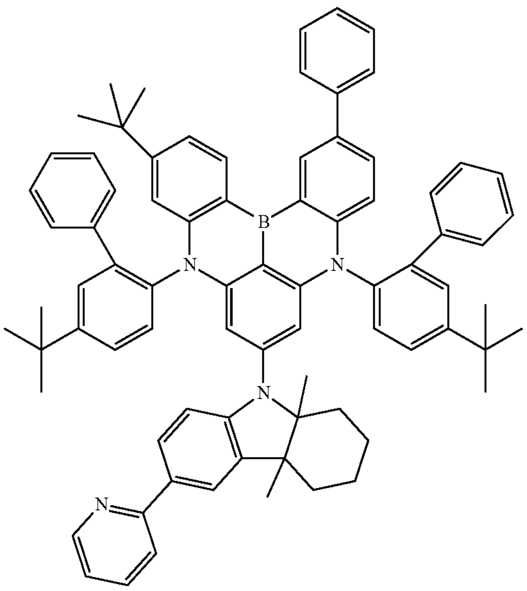
-continued
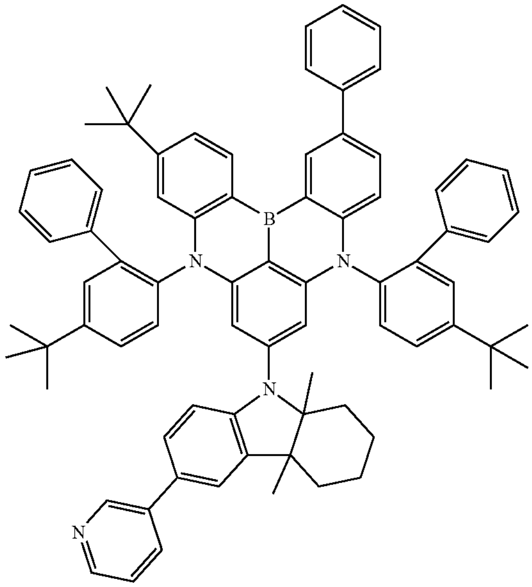
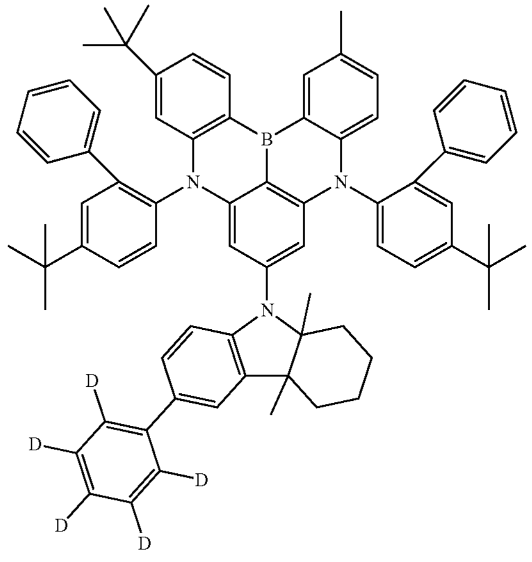
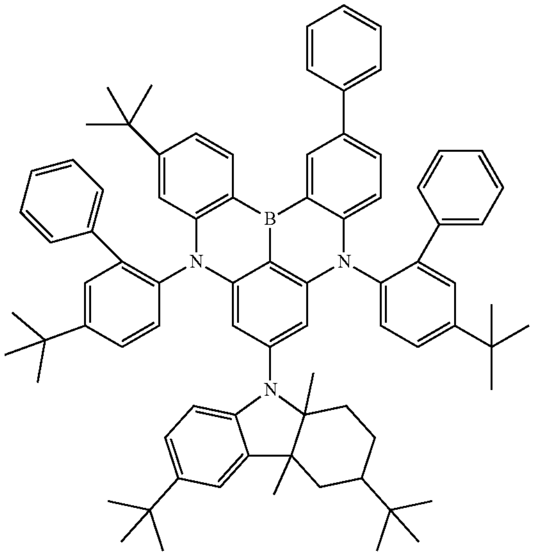

-continued
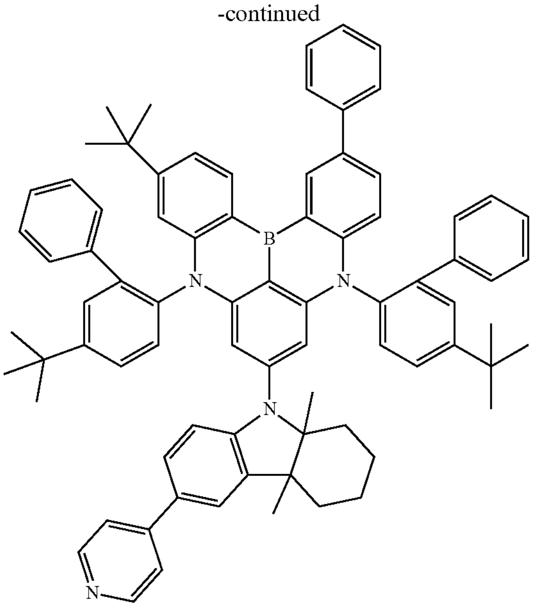
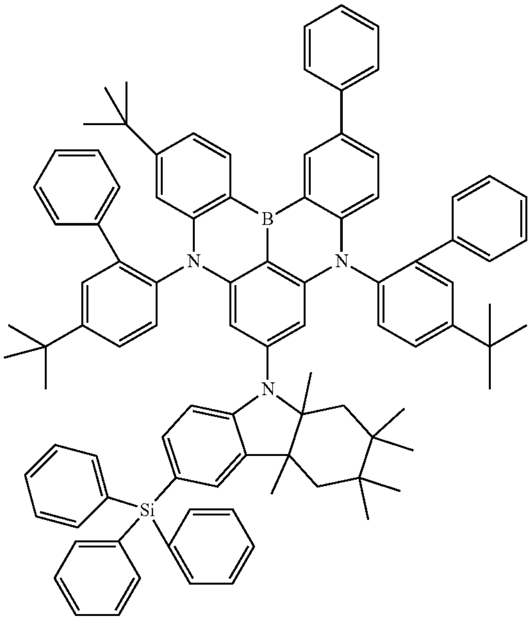
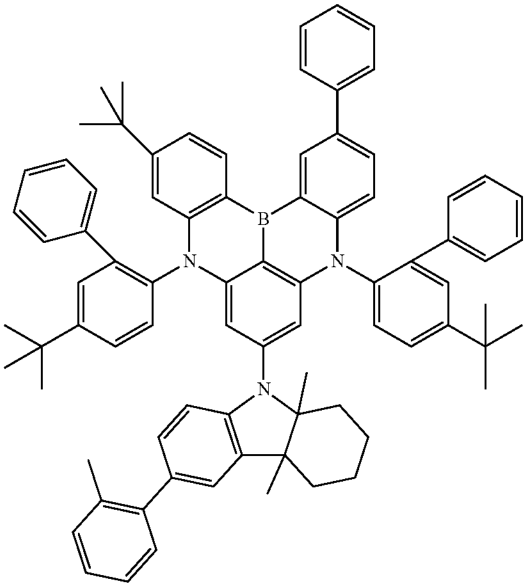
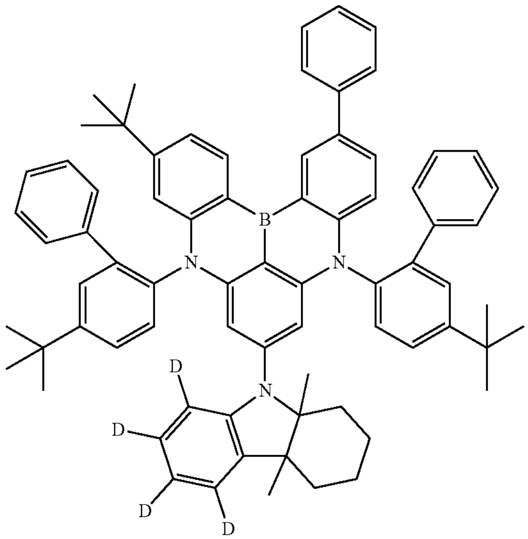
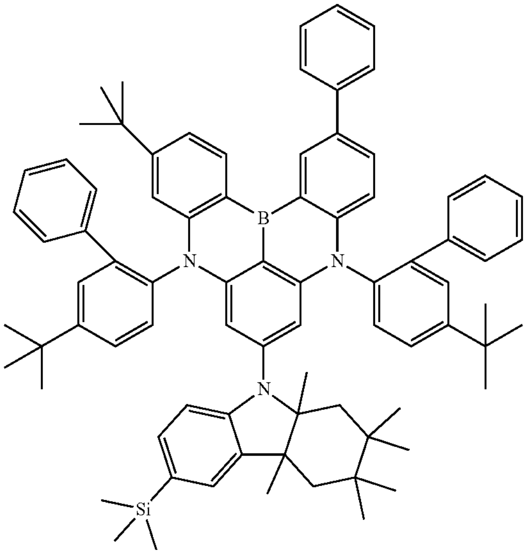
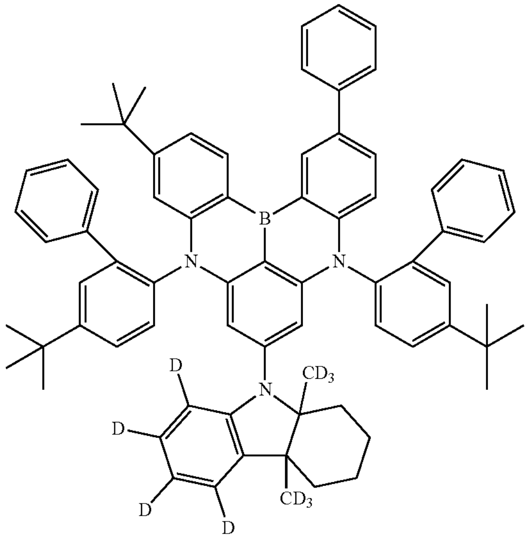

-continued
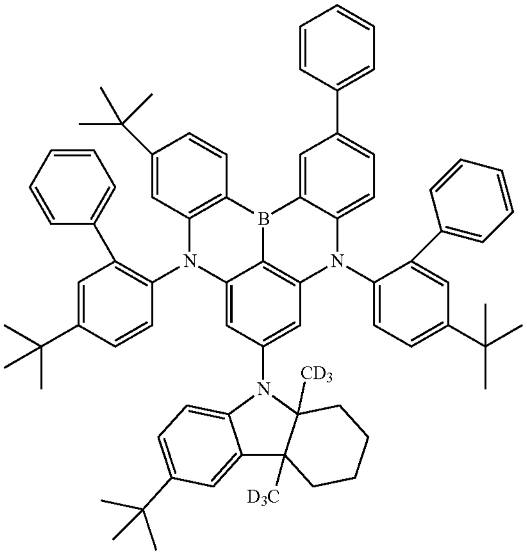
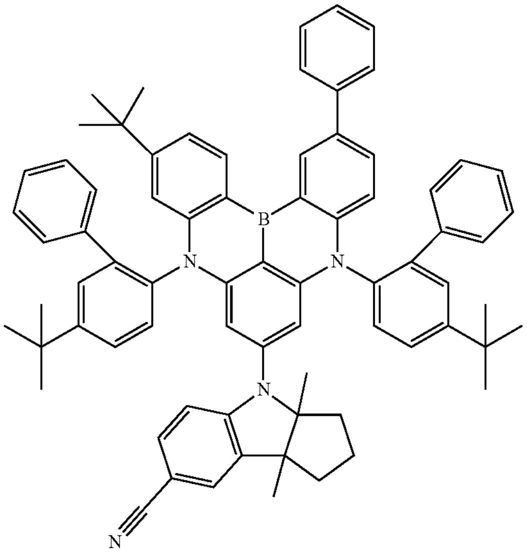
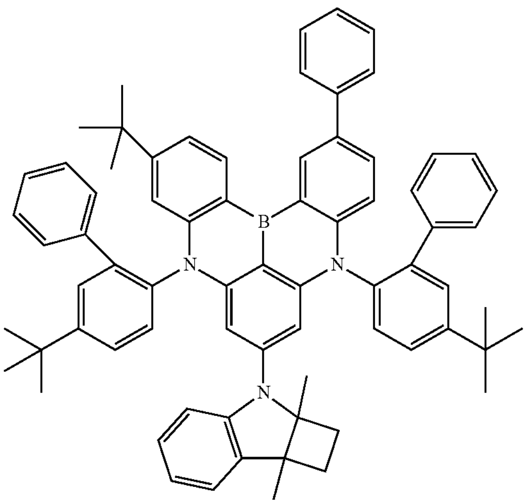
-continued
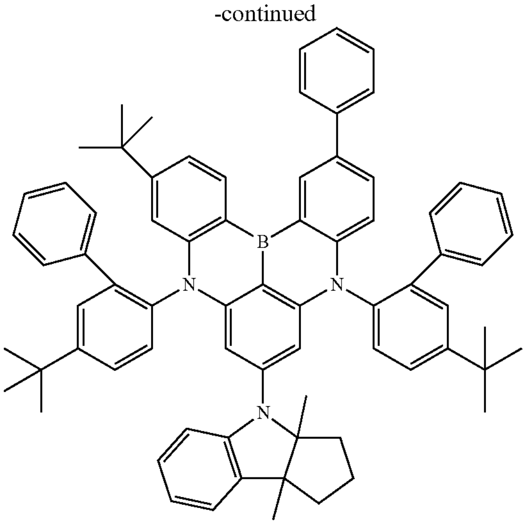
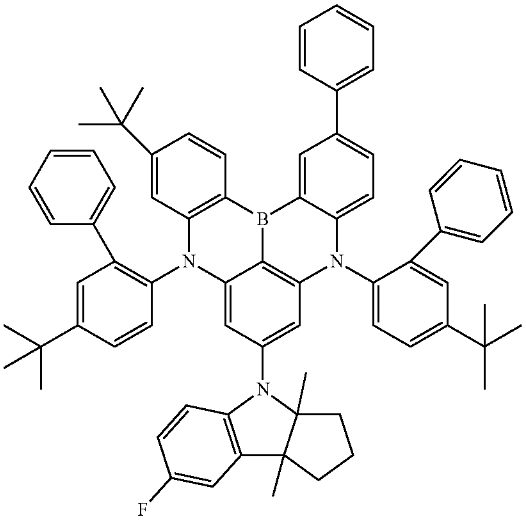
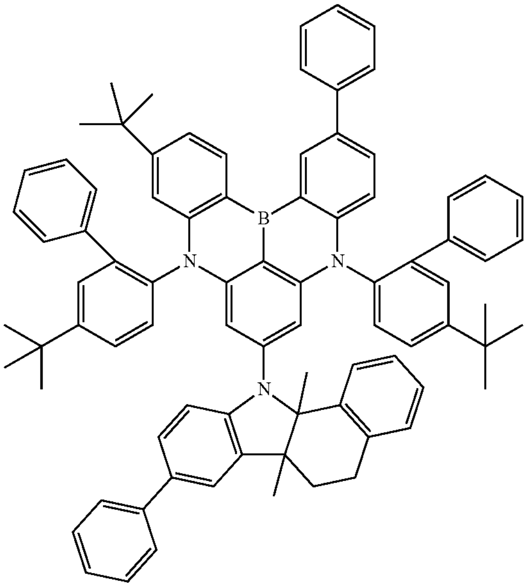

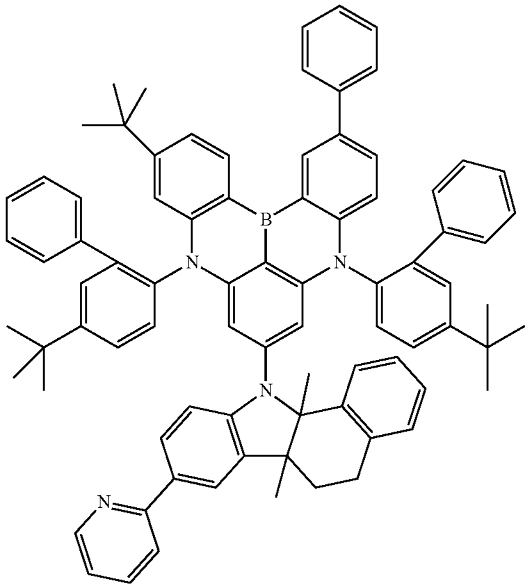
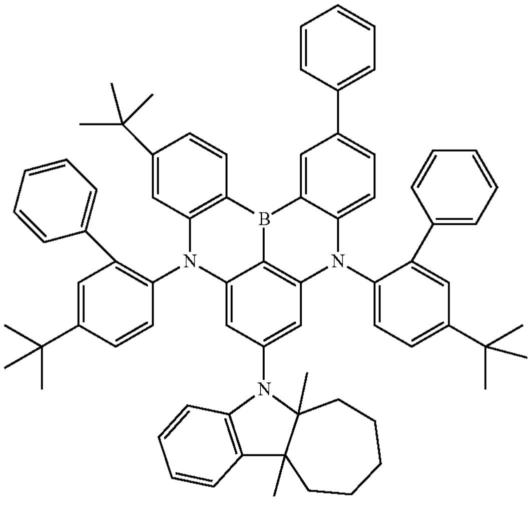
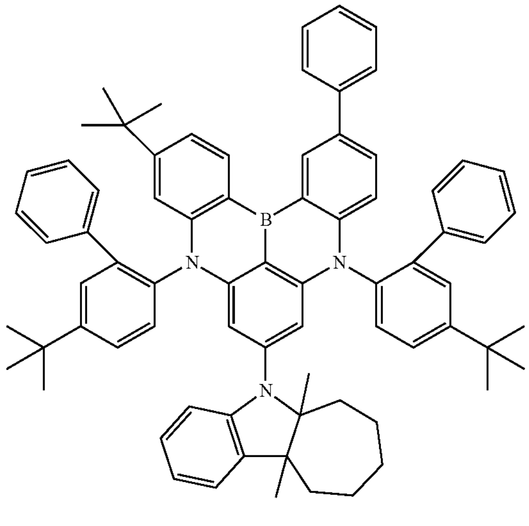
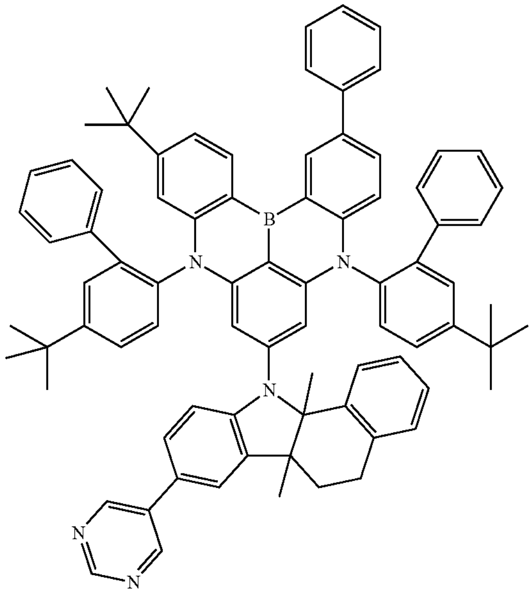
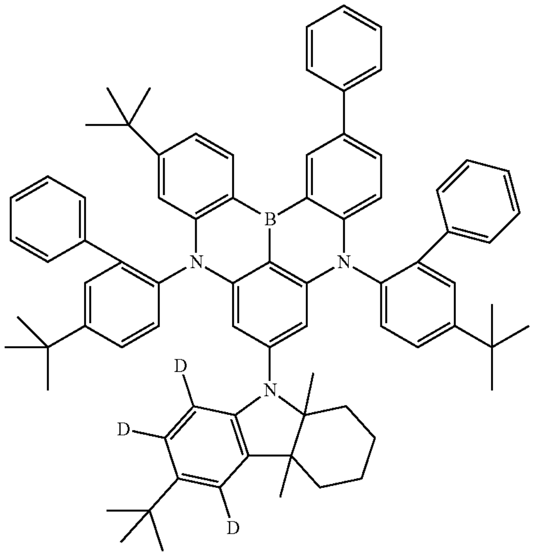
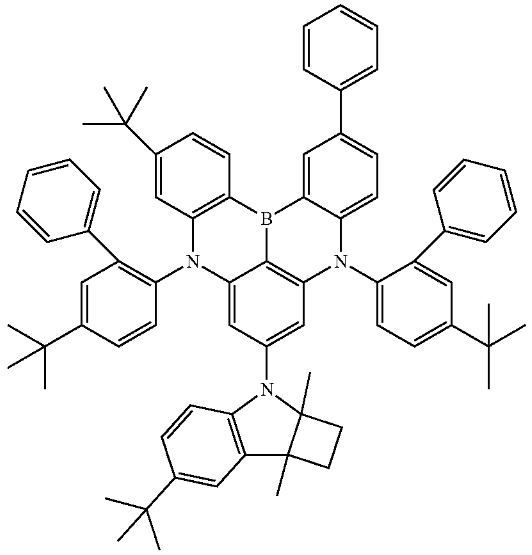

-continued
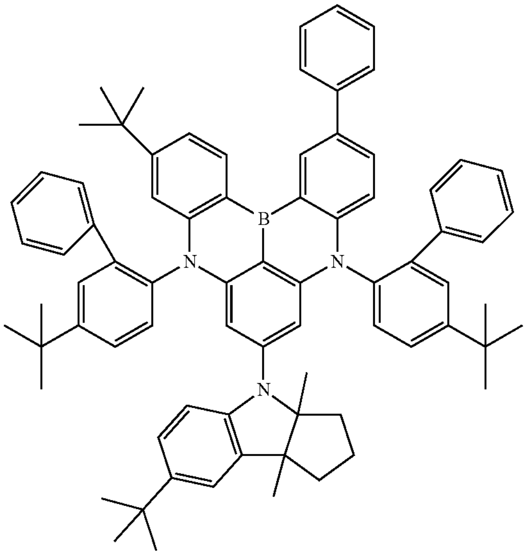
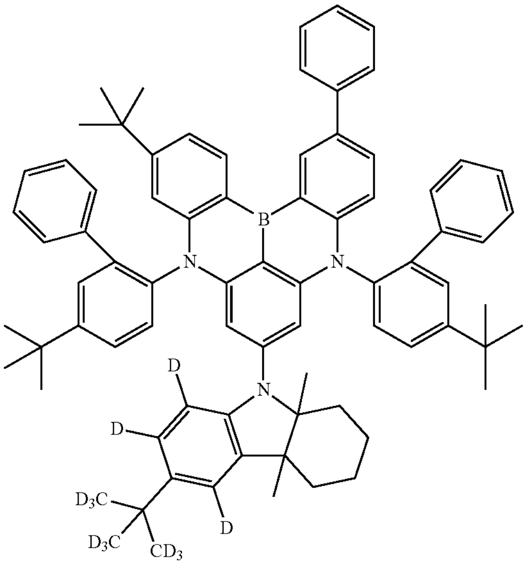
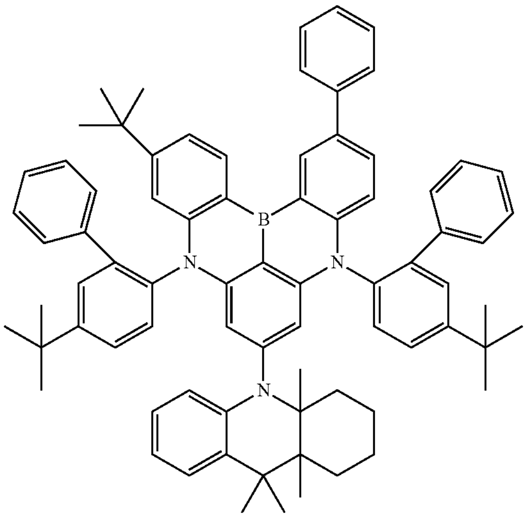
-continued
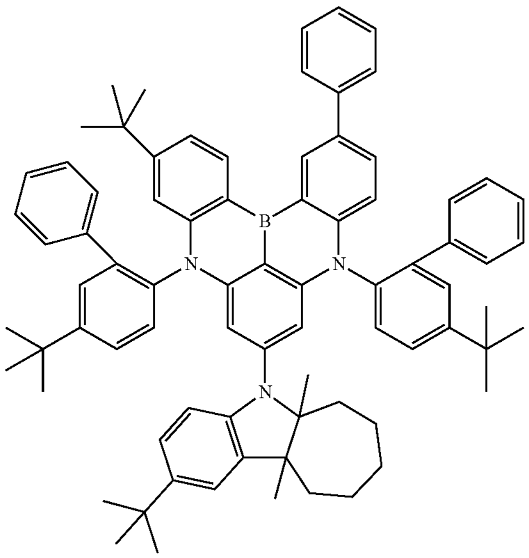
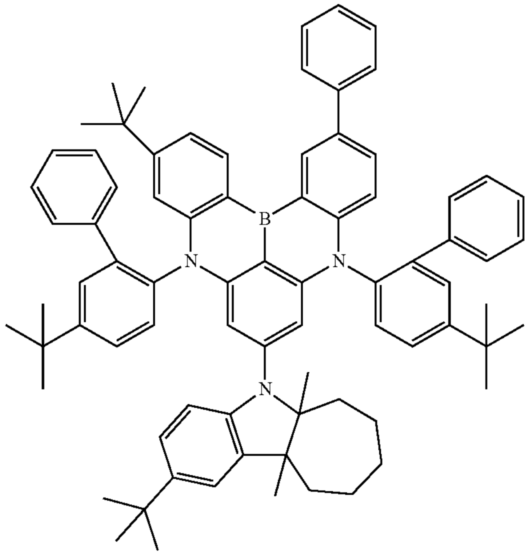
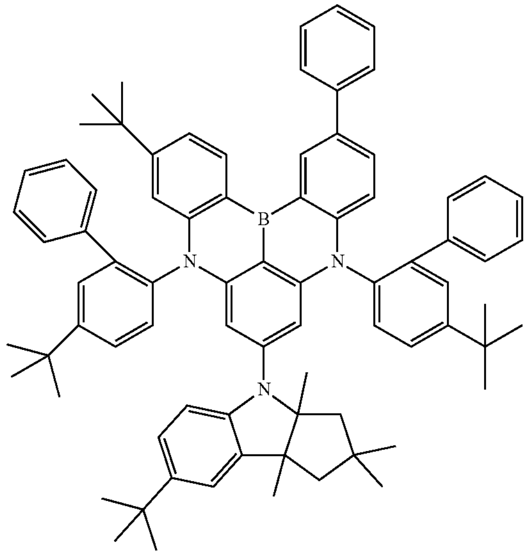

-continued
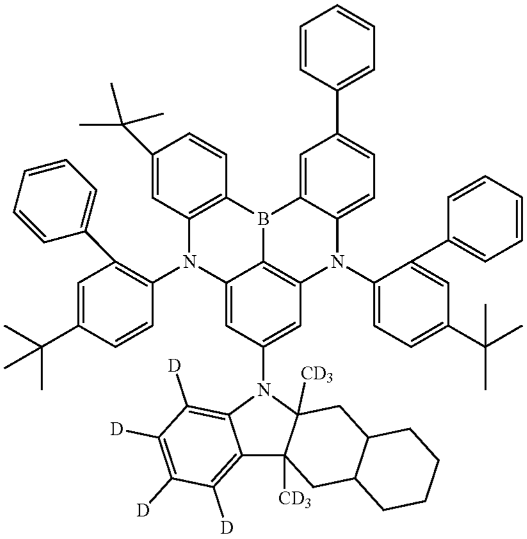
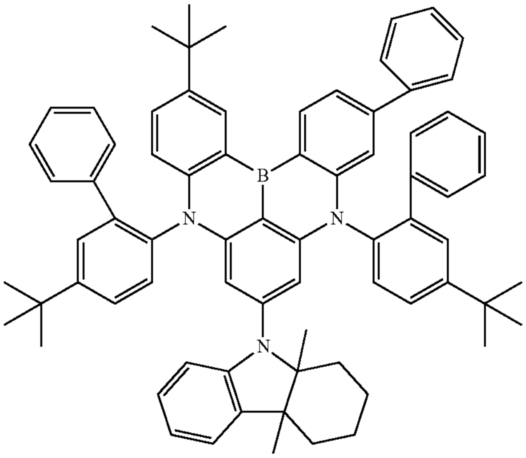
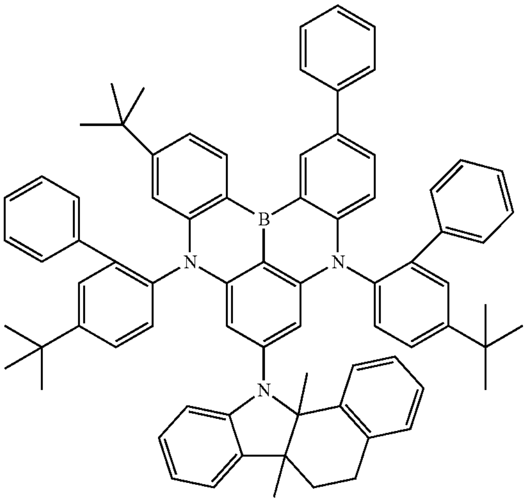
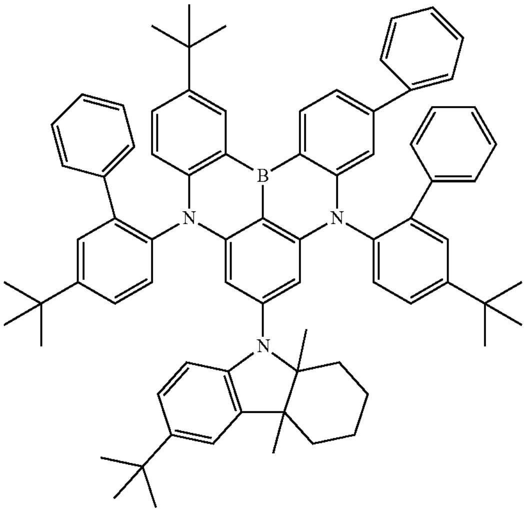
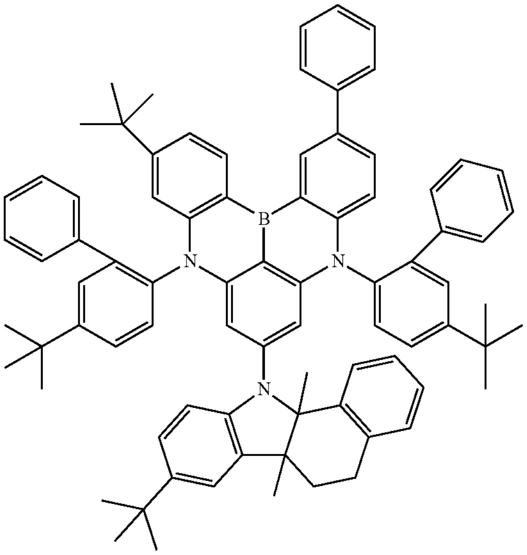
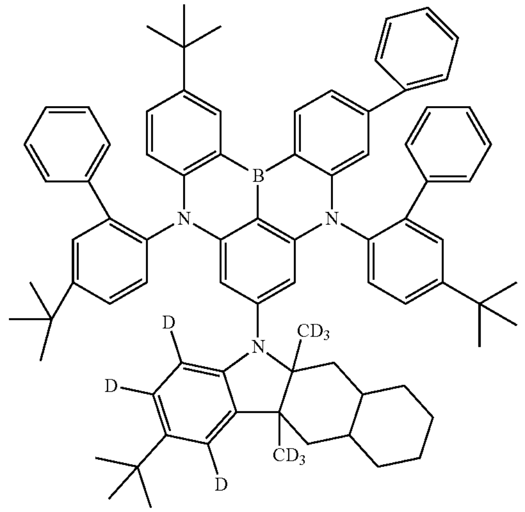
-continued -continued
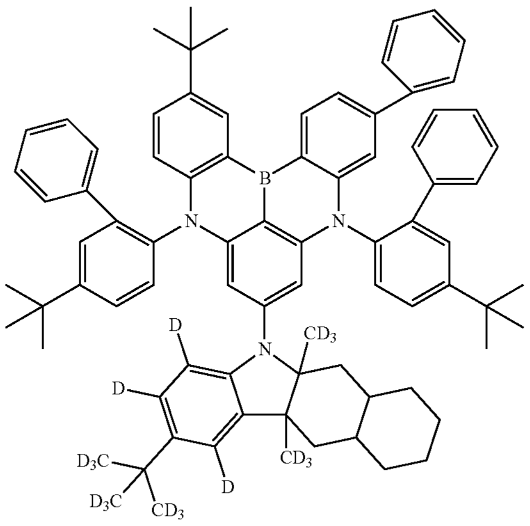
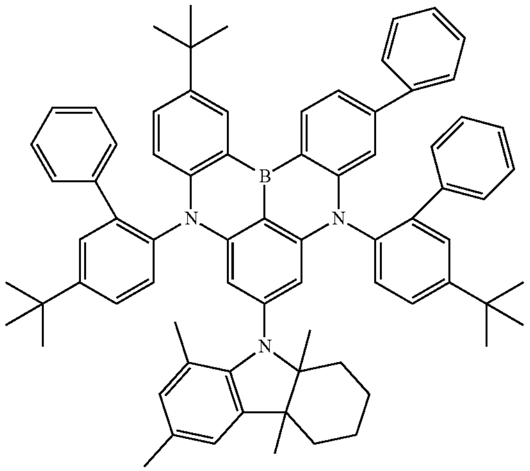
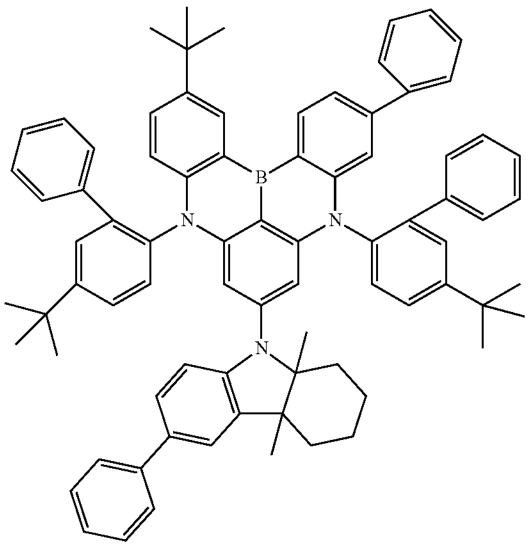
-continued
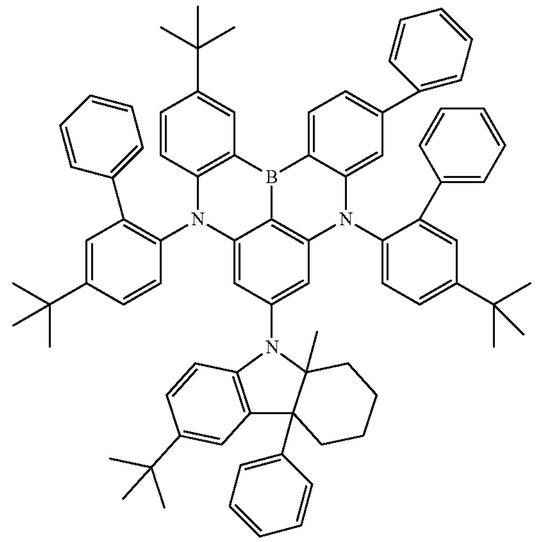
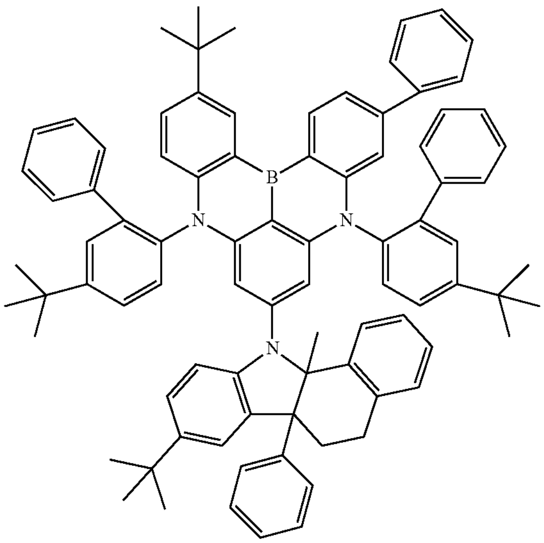
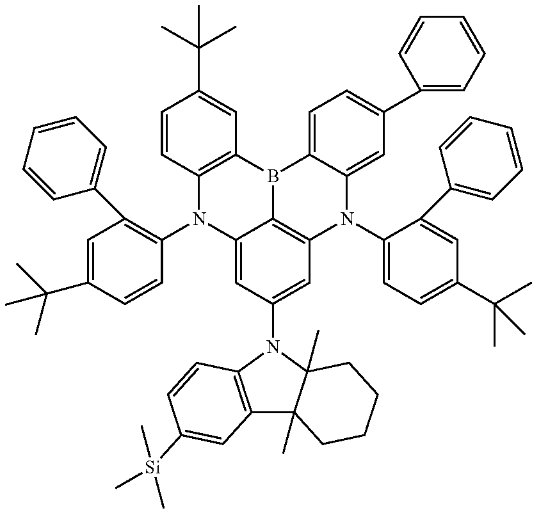

-continued
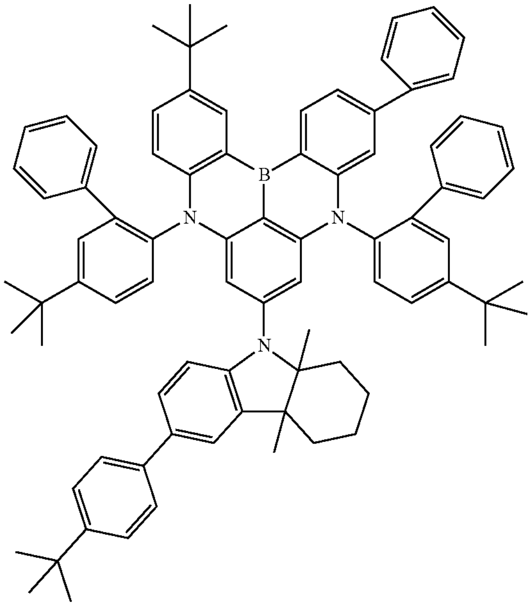
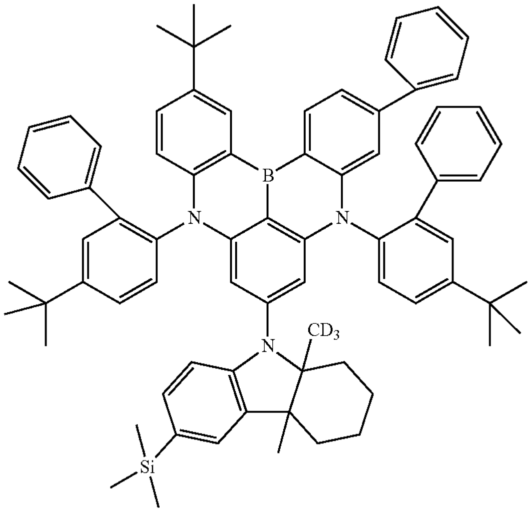
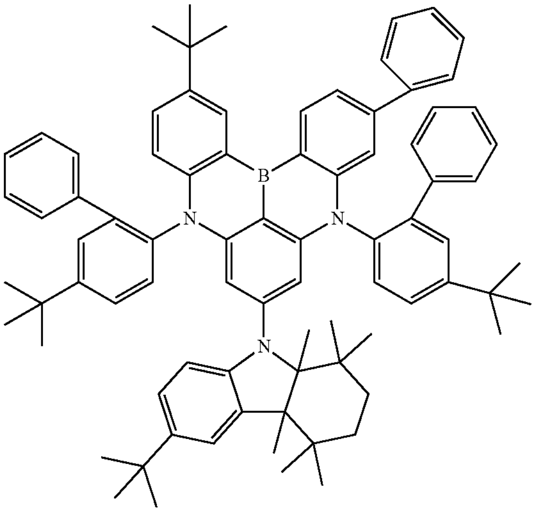
-continued
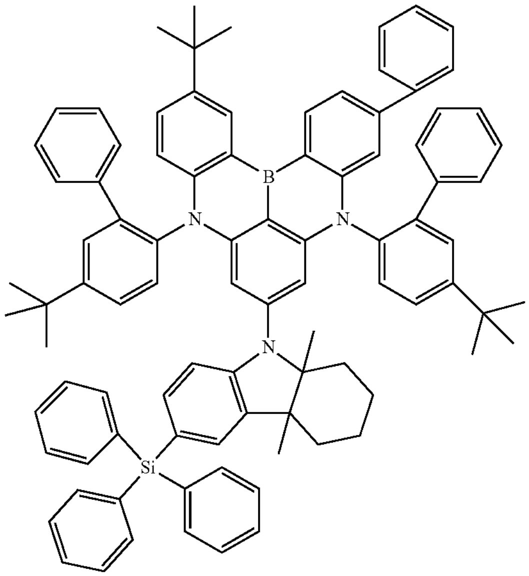
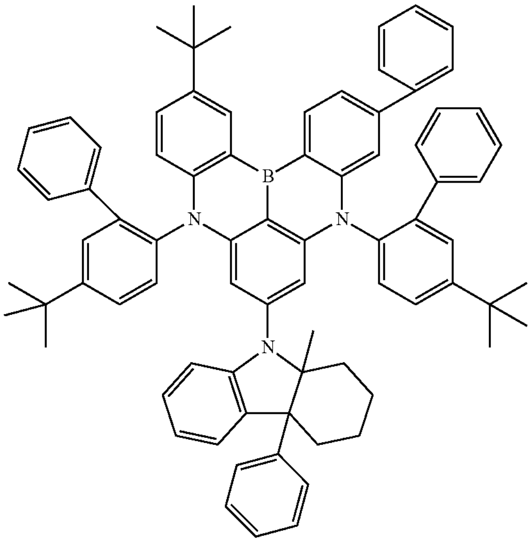

-continued
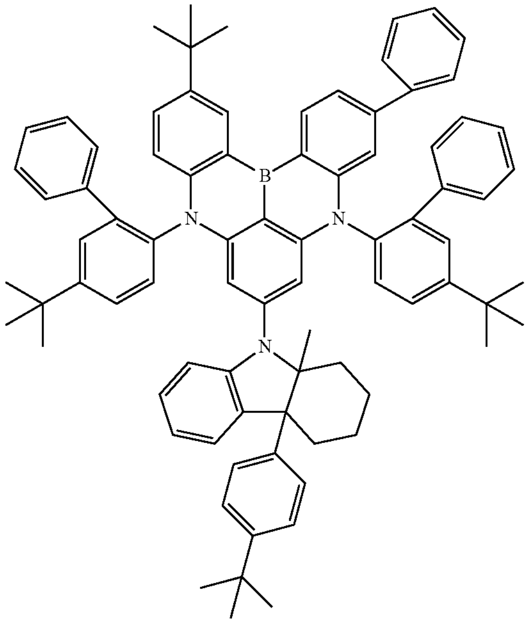
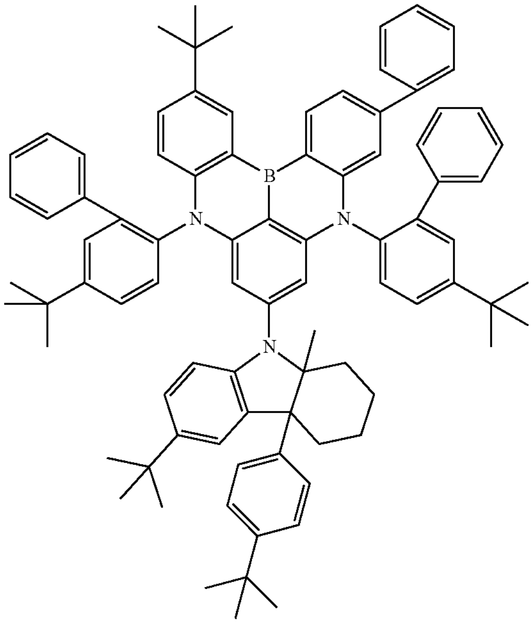
-continued
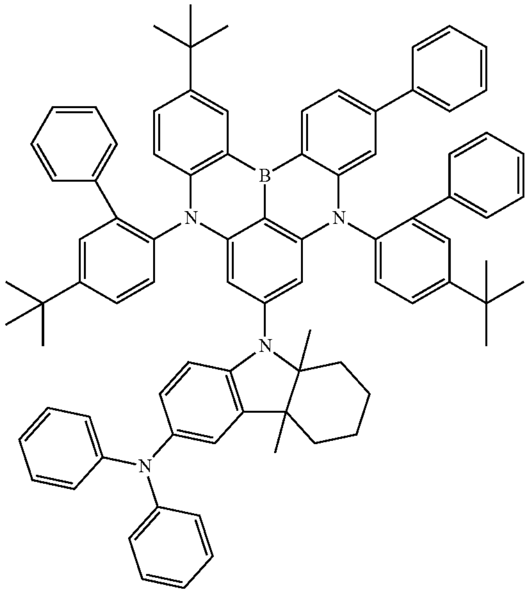
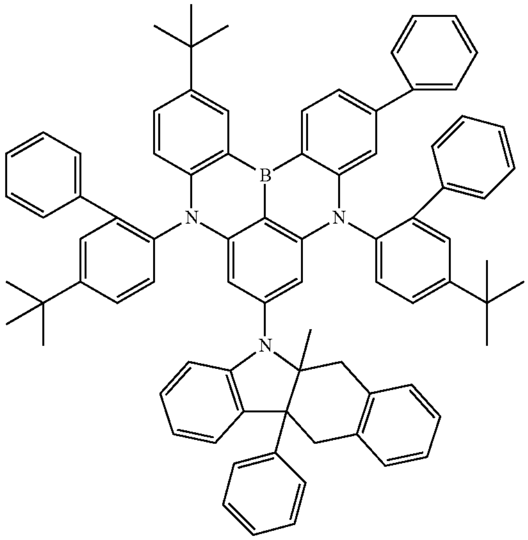
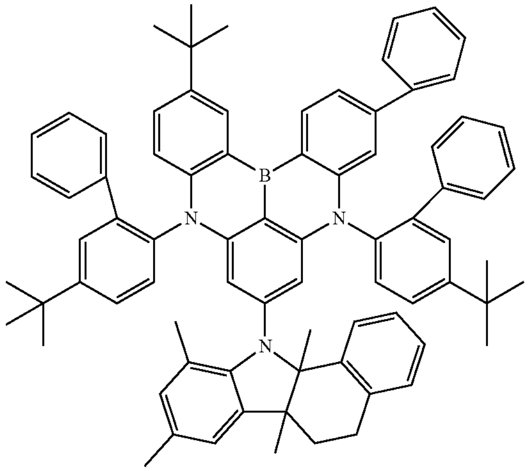

-continued
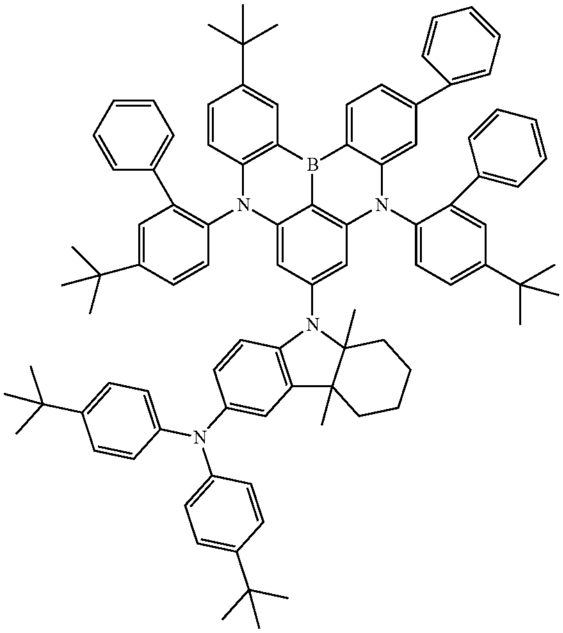
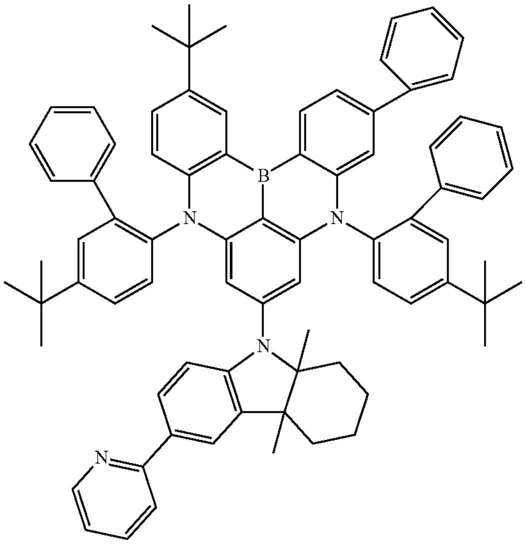
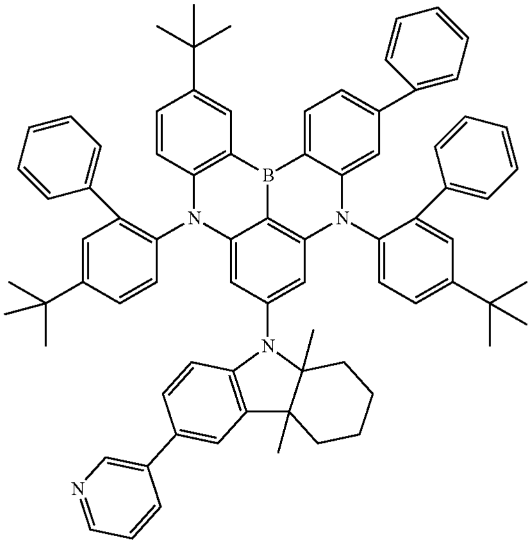
-continued
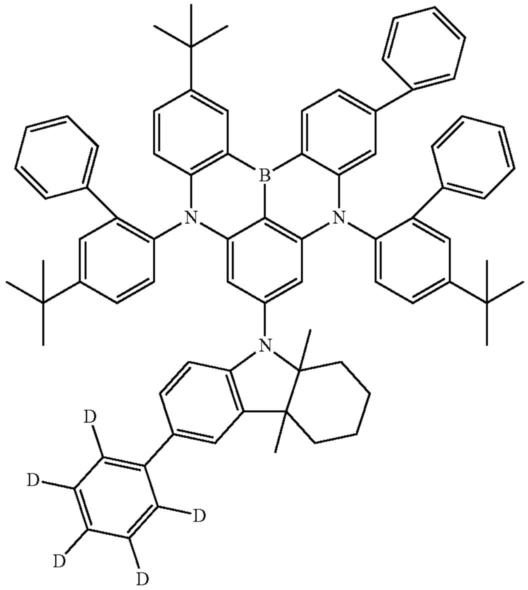
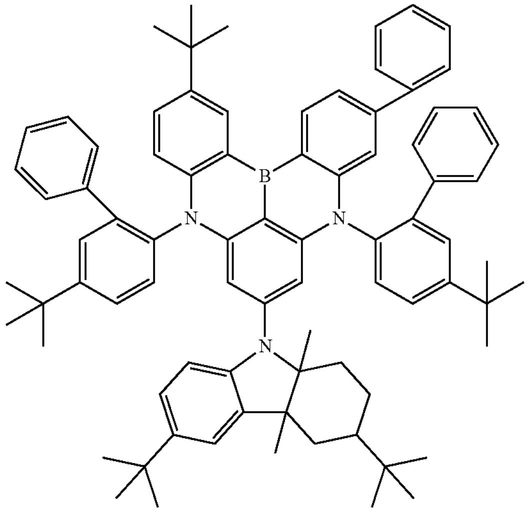
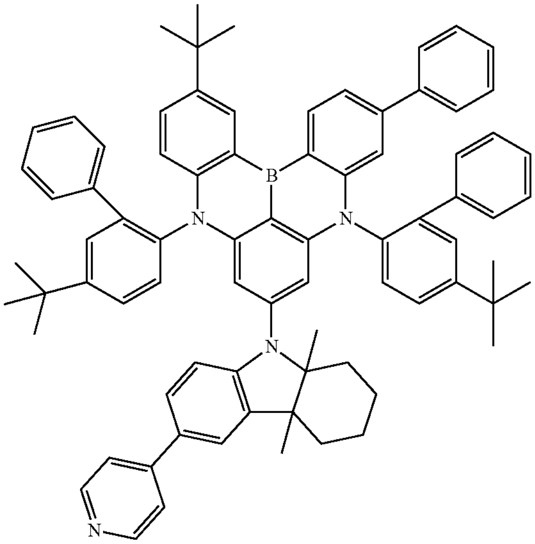

-continued
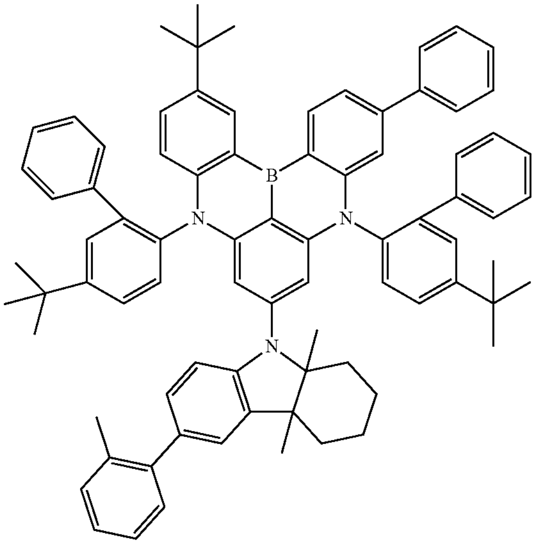
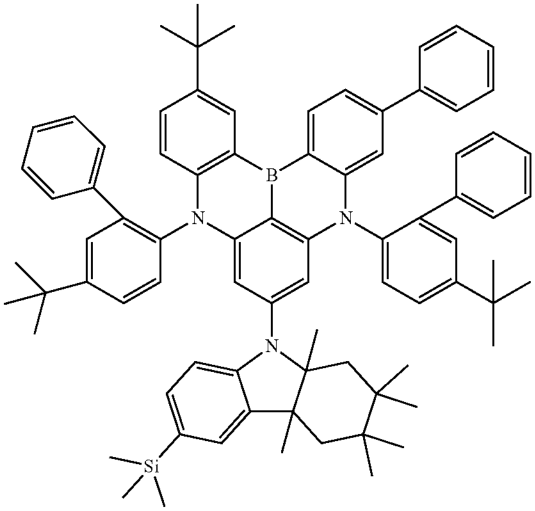
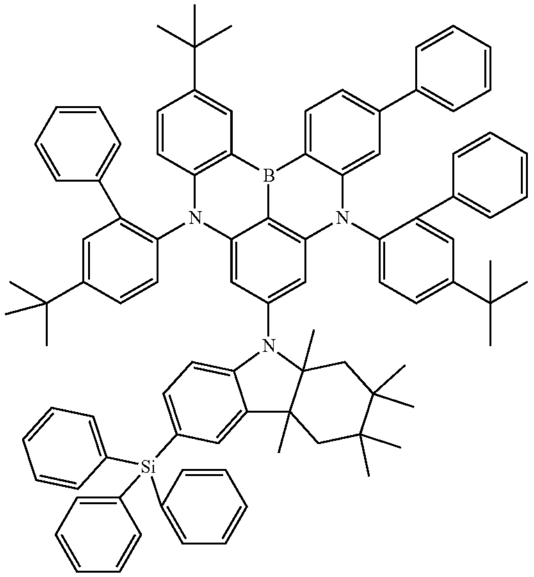
-continued
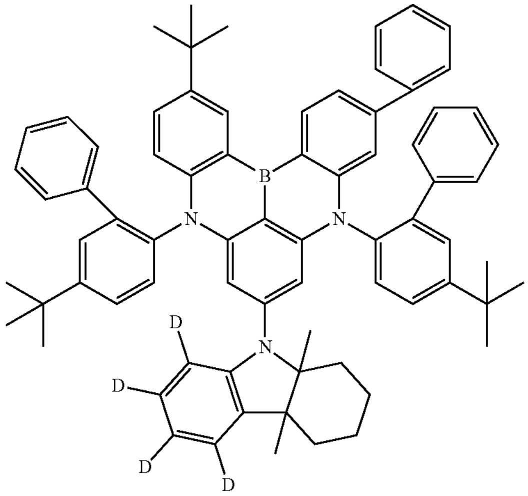
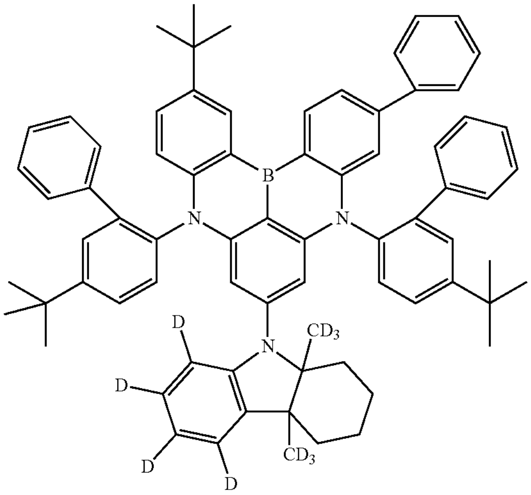
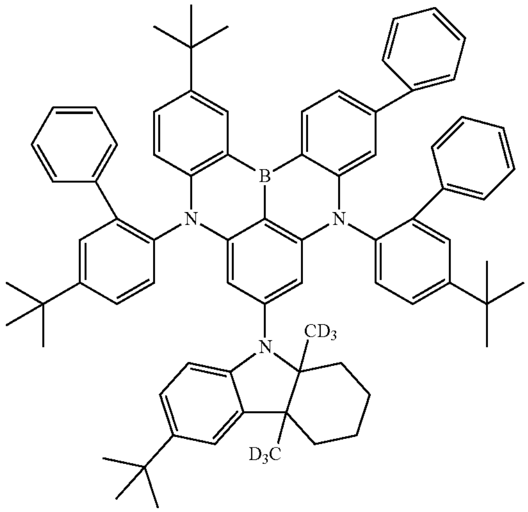

-continued
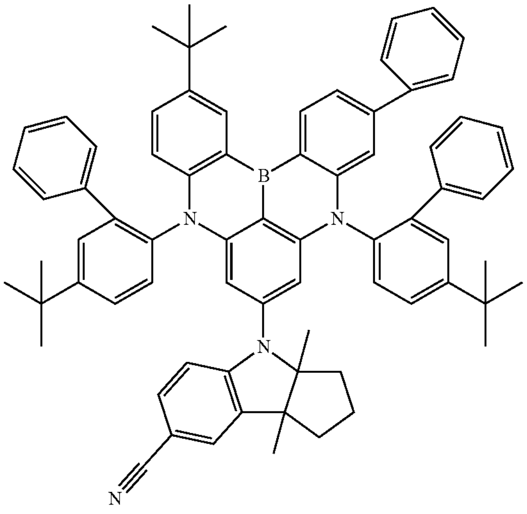
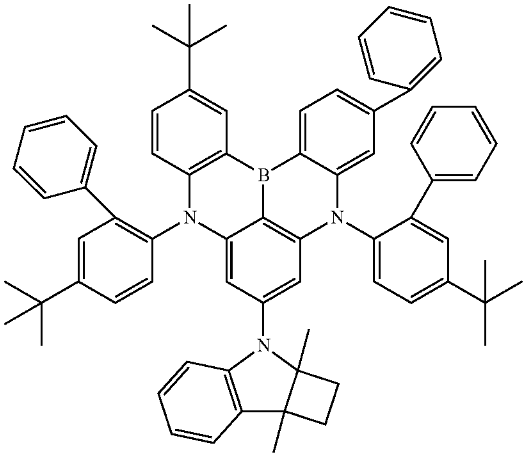
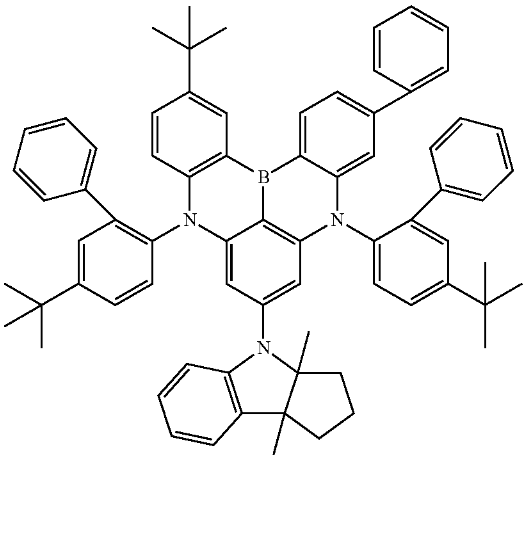
-continued
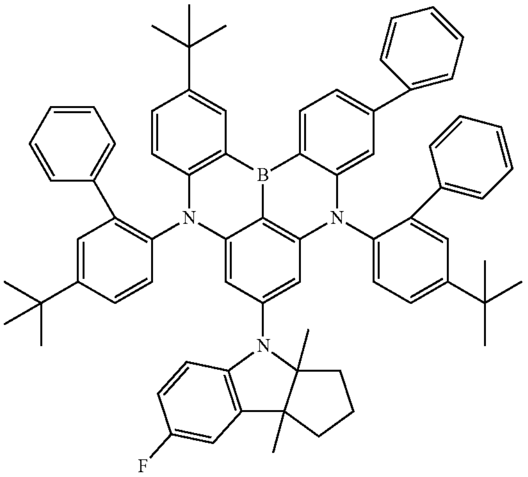
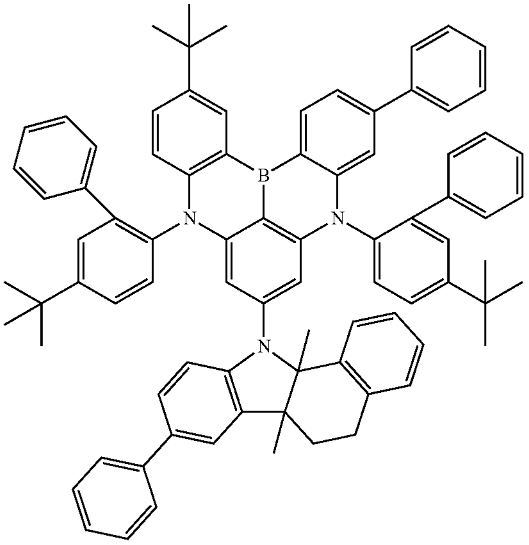
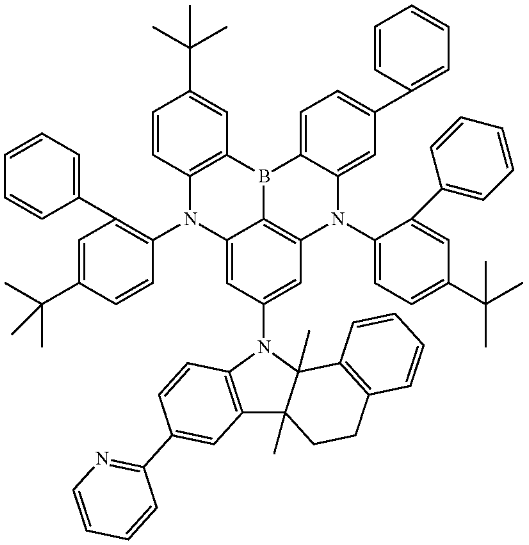

-continued
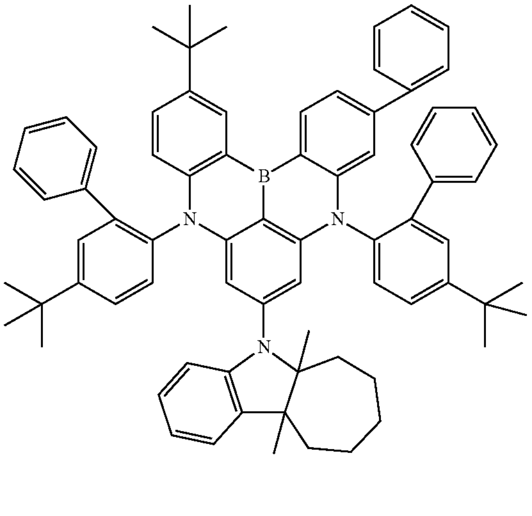
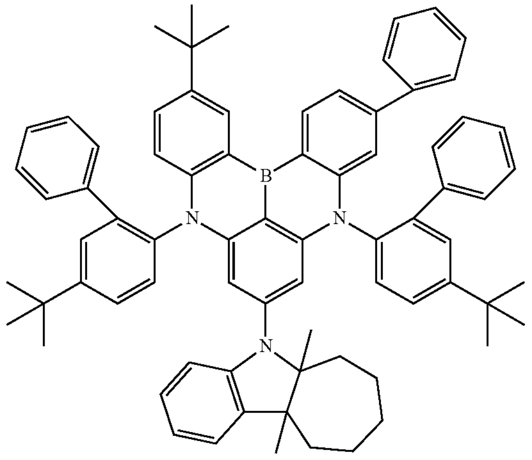
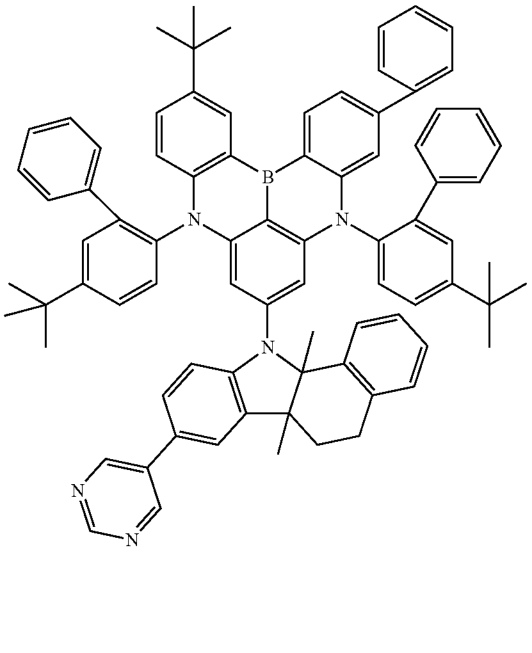
-continued
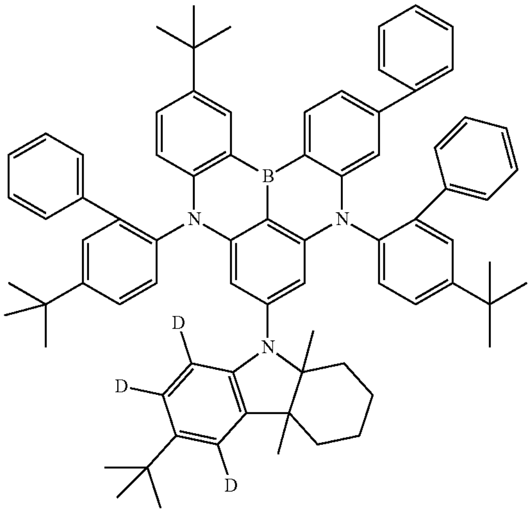
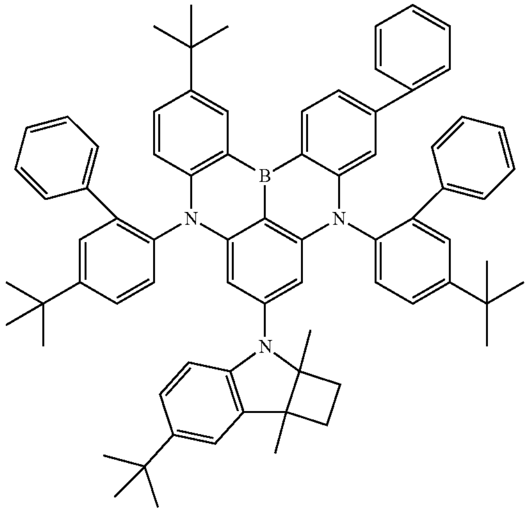
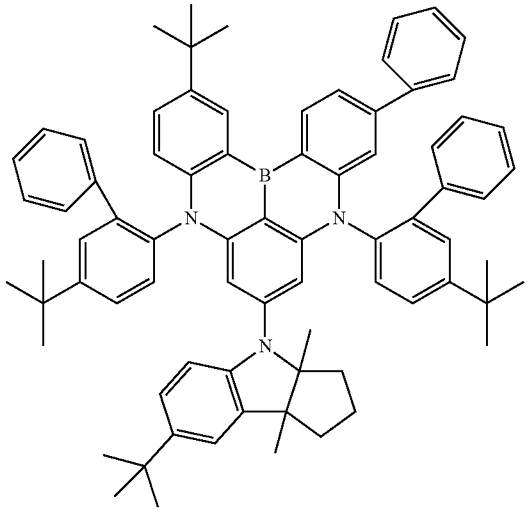

-continued
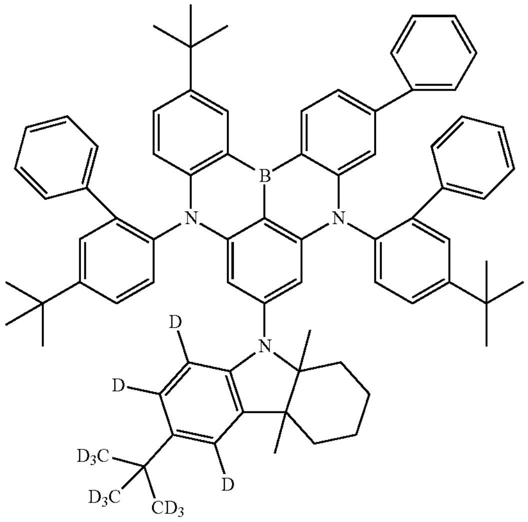
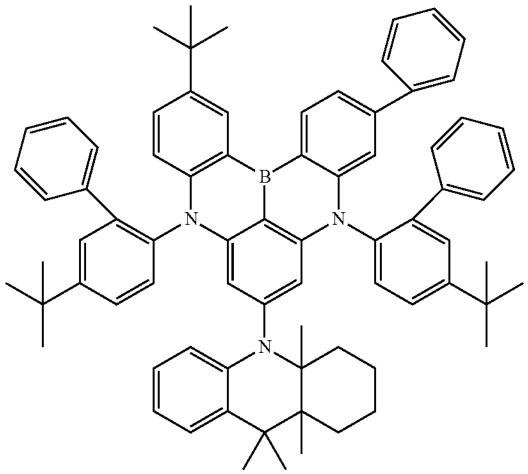
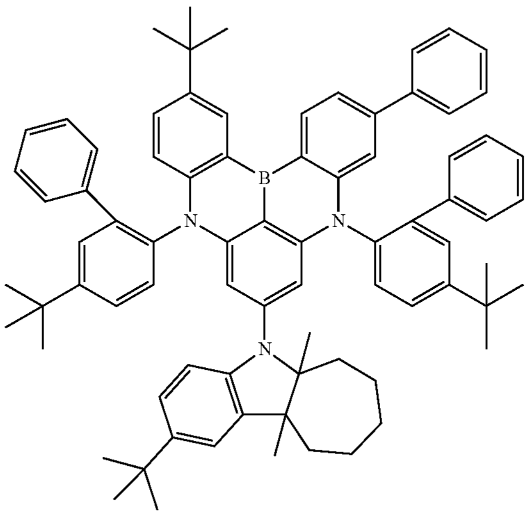
-continued
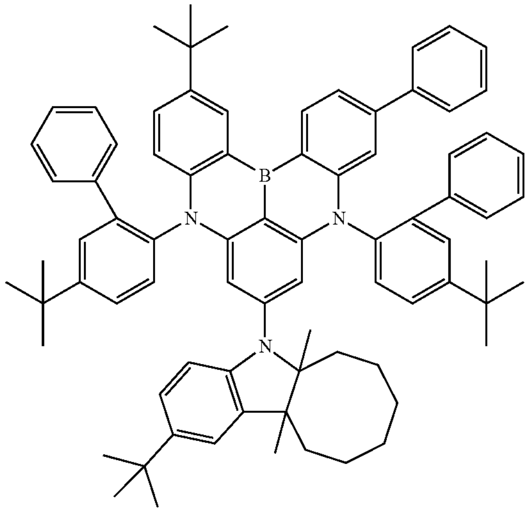
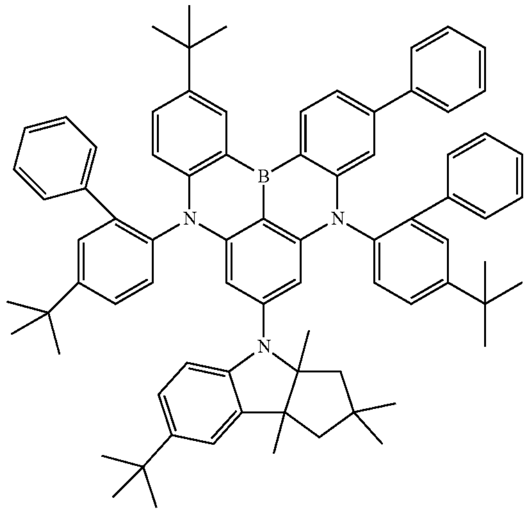
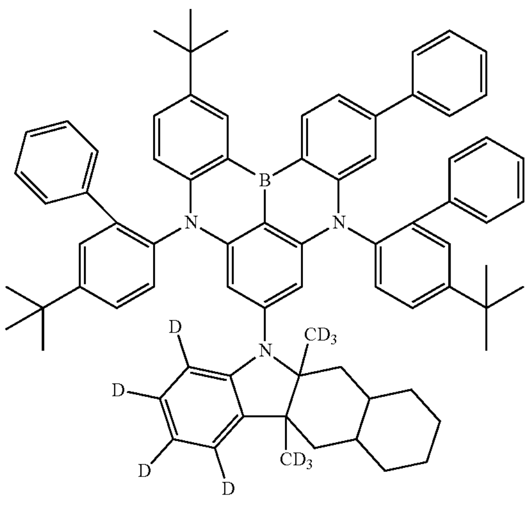

-continued
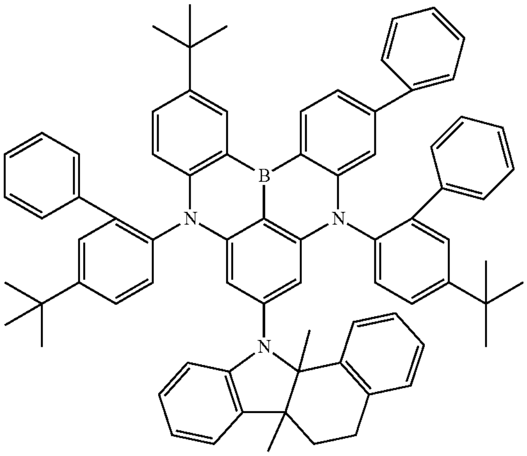
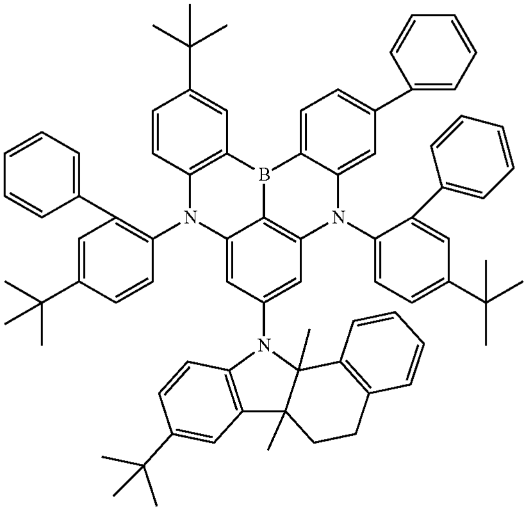
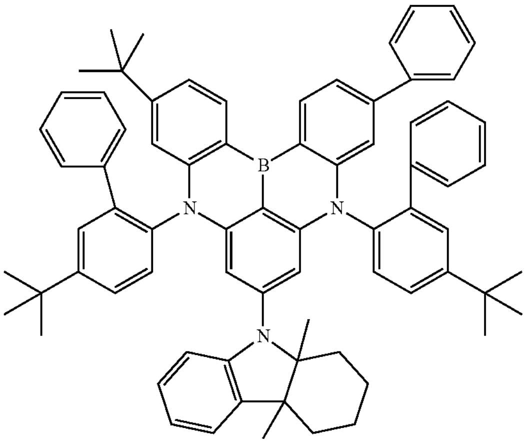
-continued
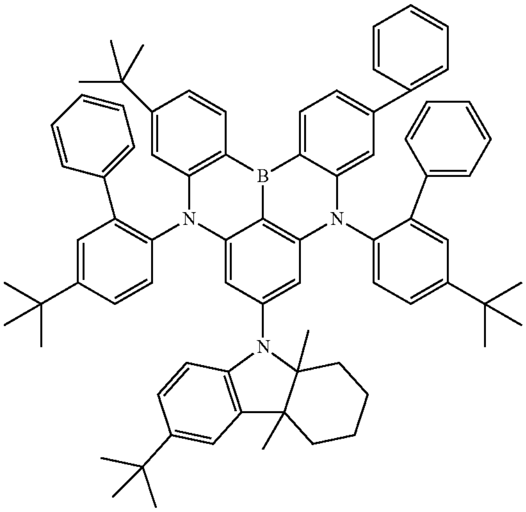
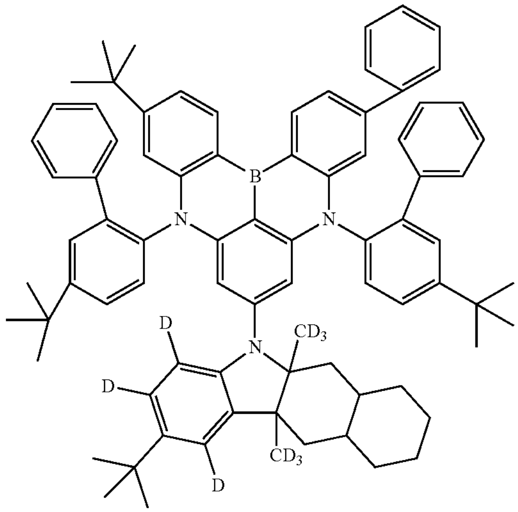
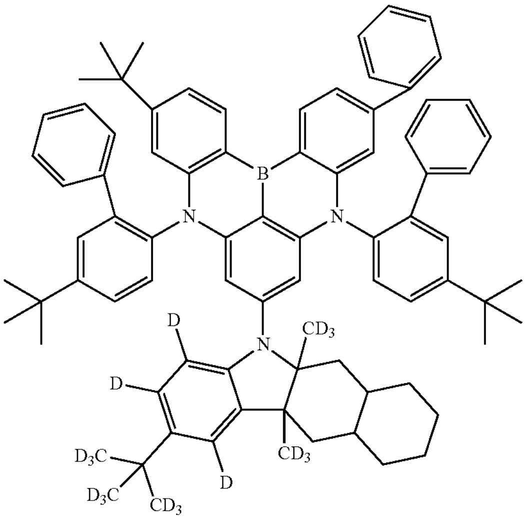

-continued
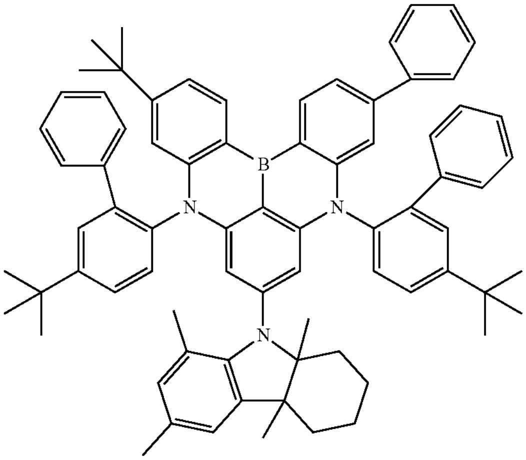
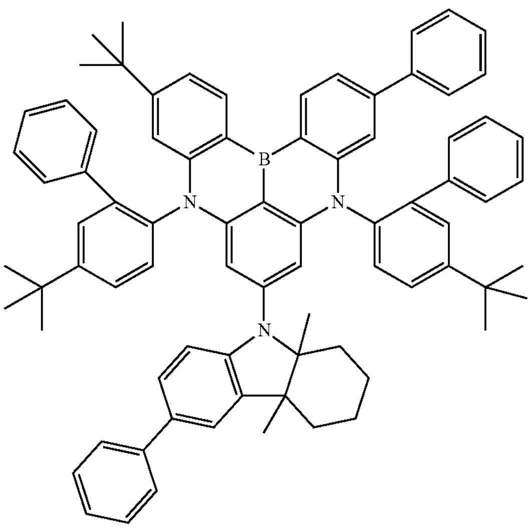
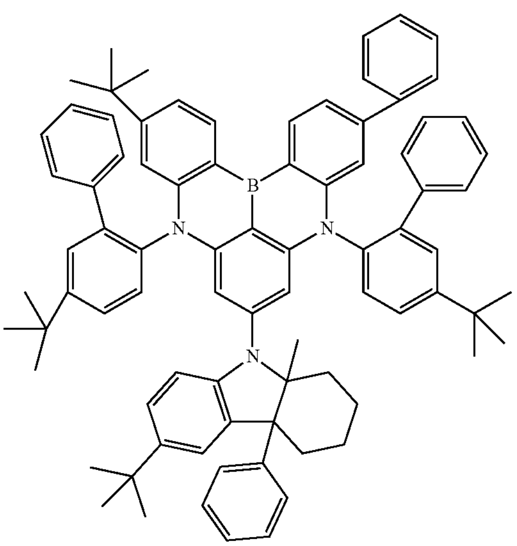
-continued
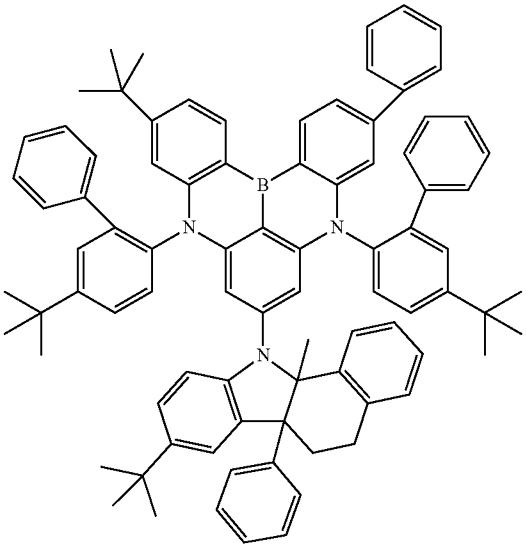
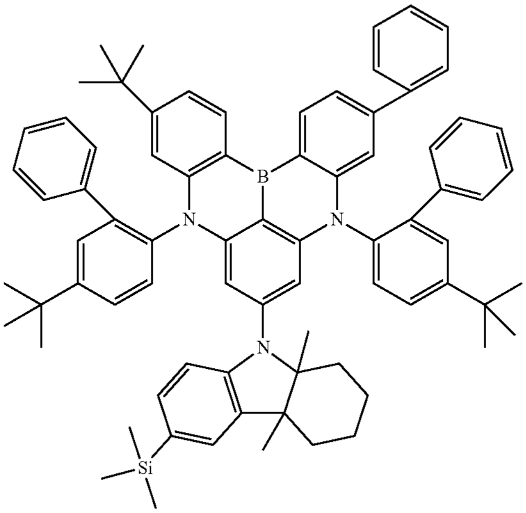
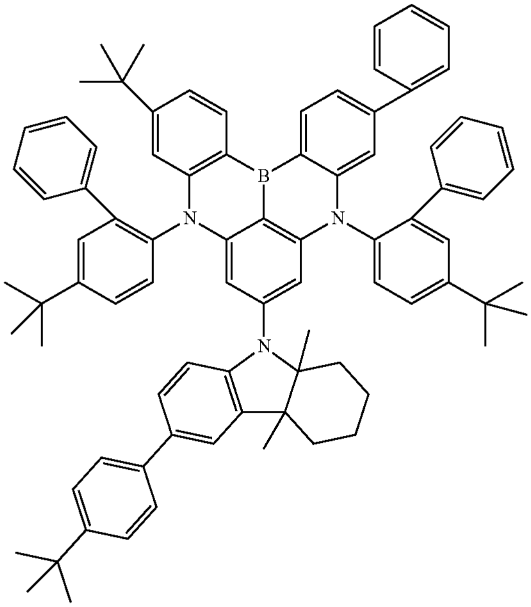

-continued
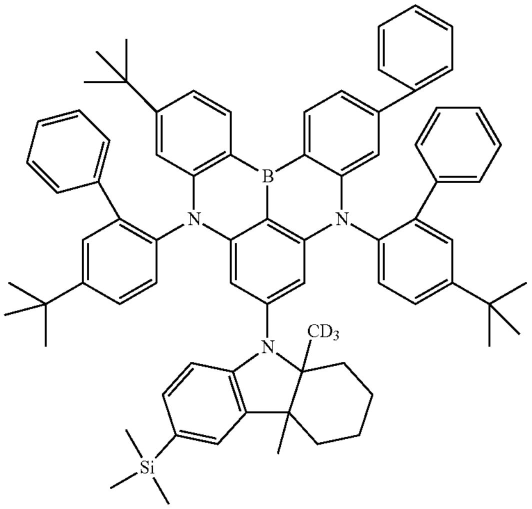
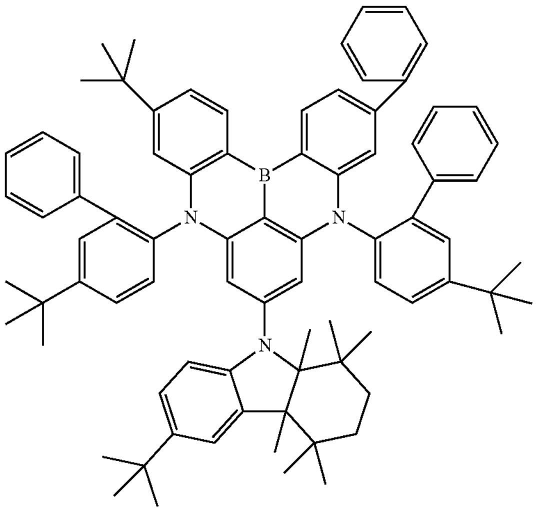
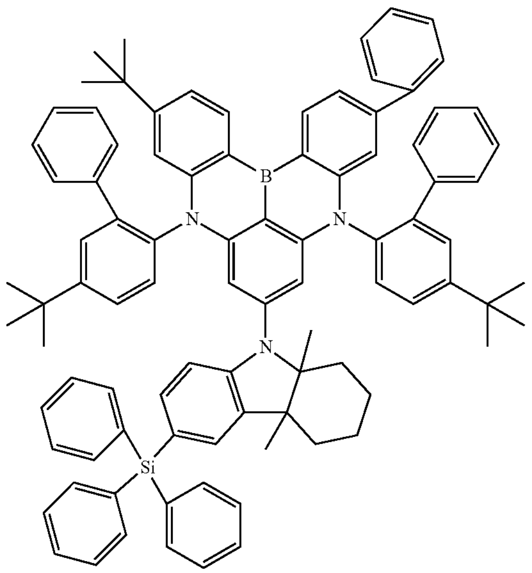
-continued
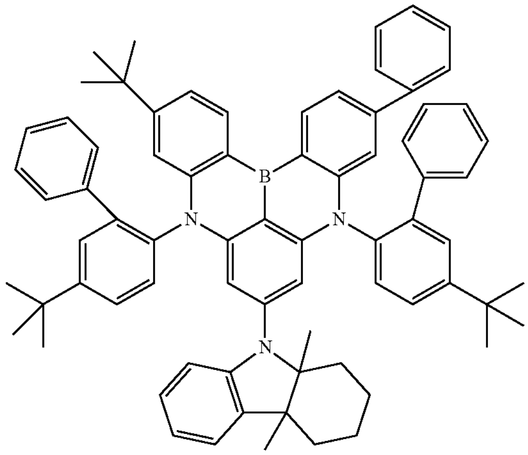
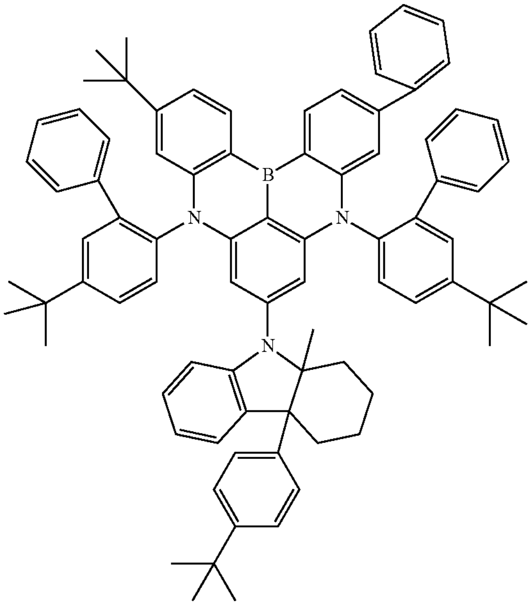
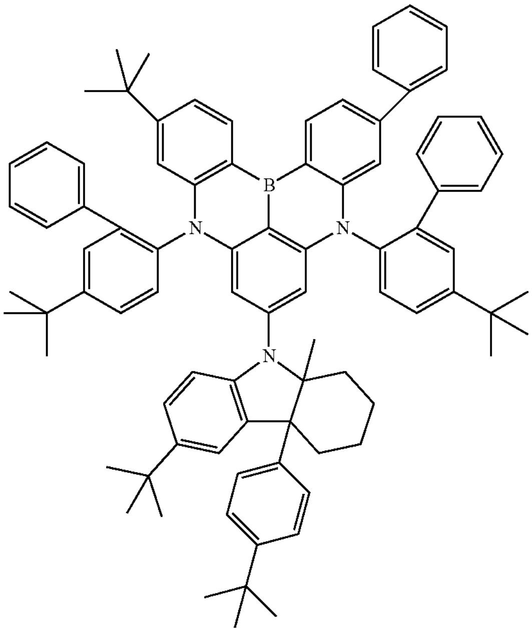

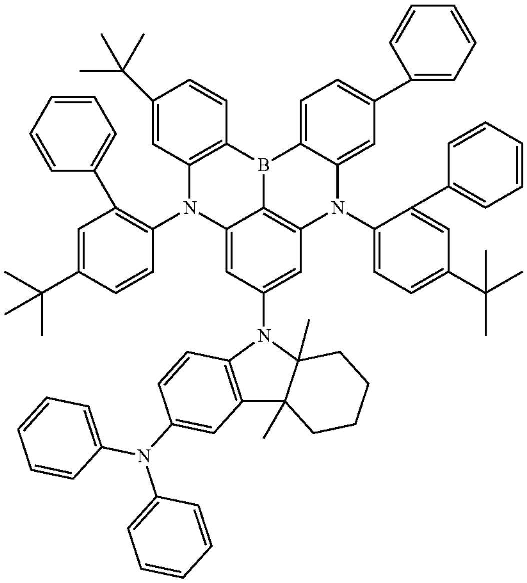
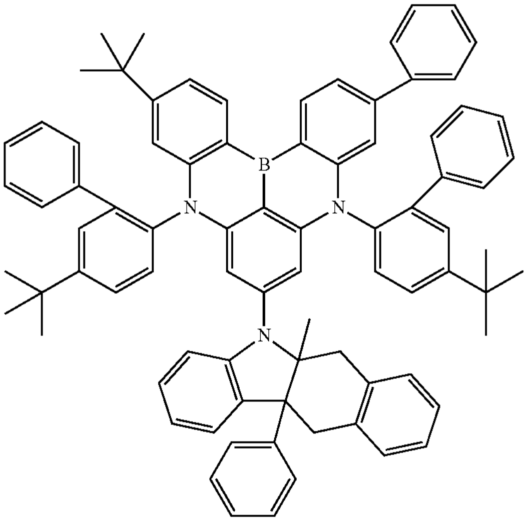
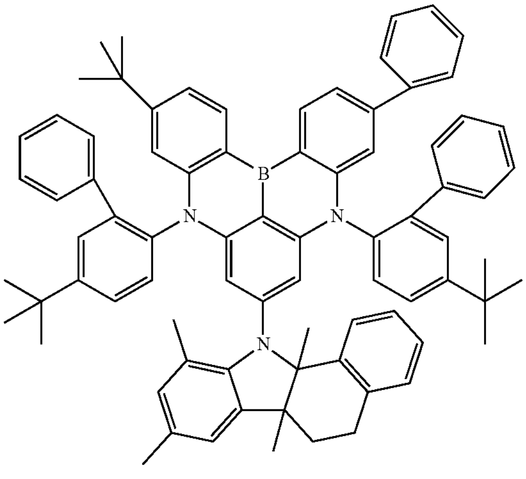
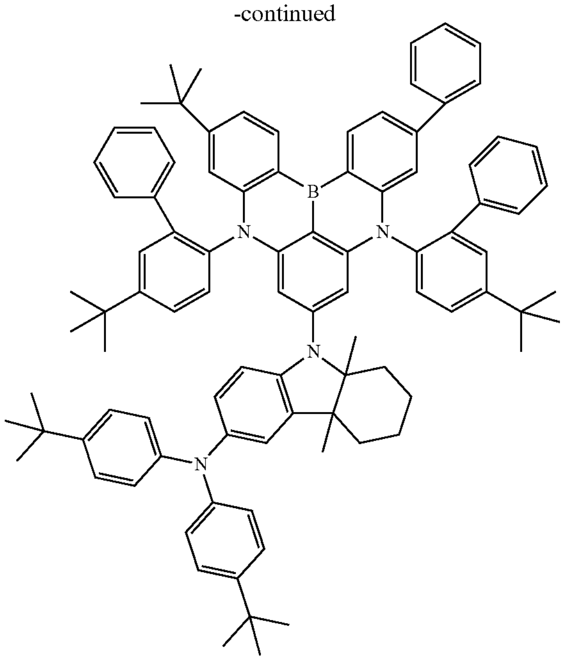
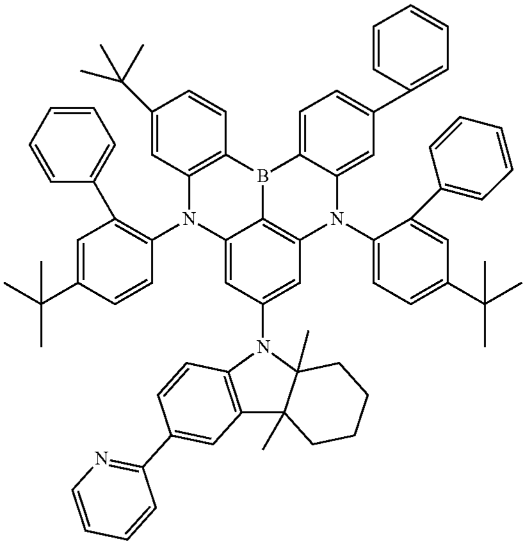
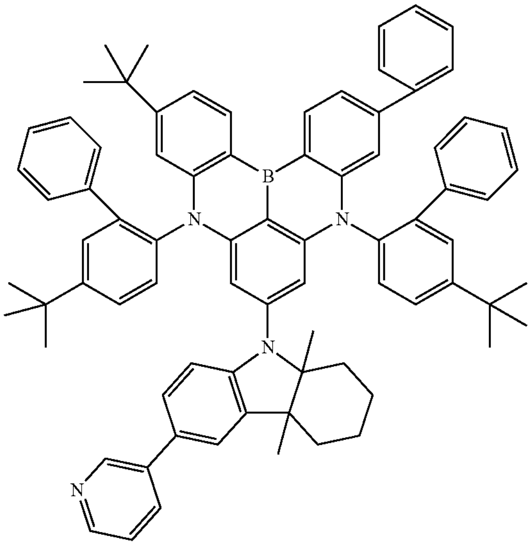

-continued
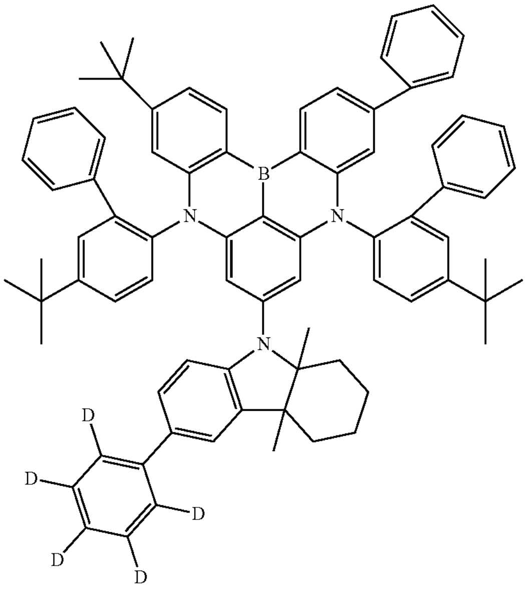
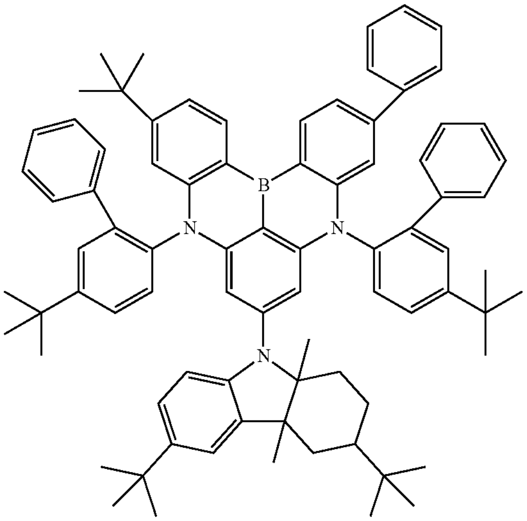
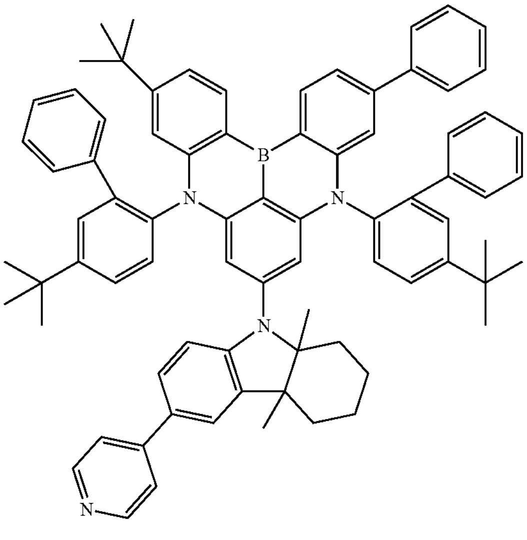
-continued
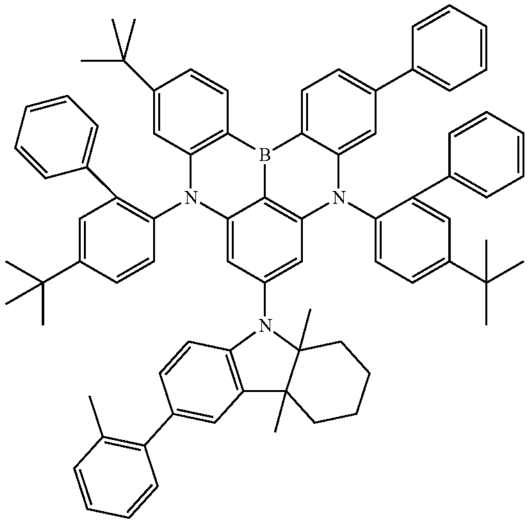
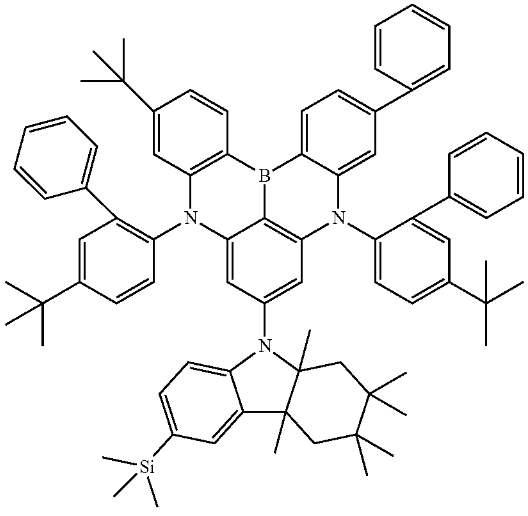
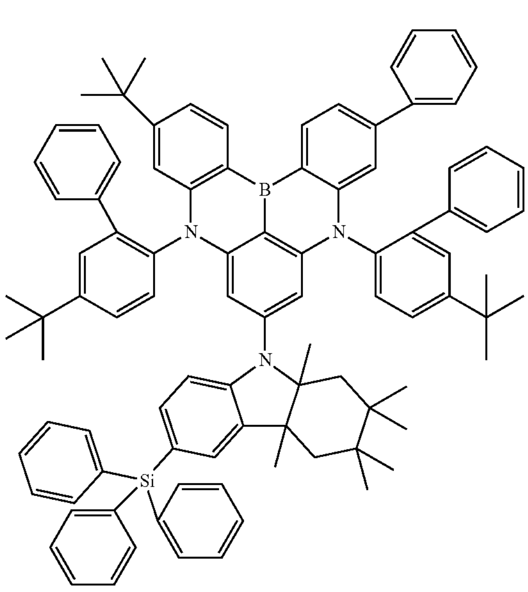

-continued
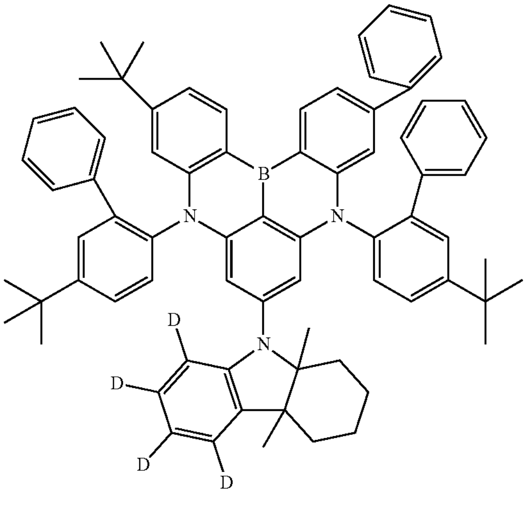
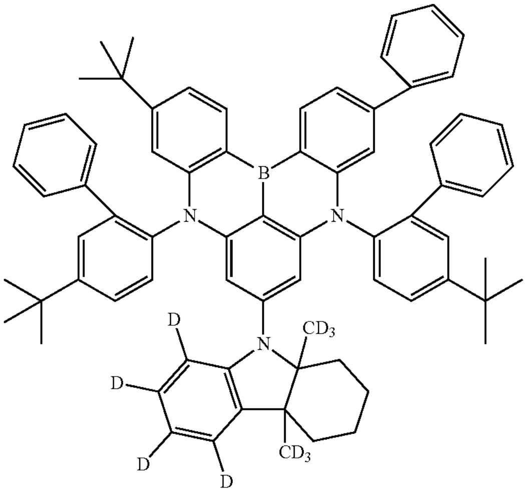
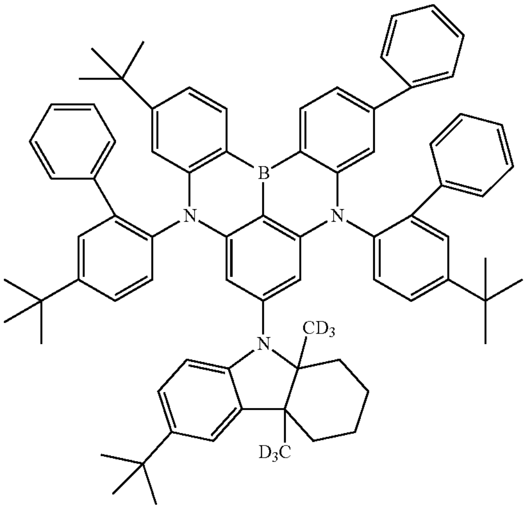
-continued
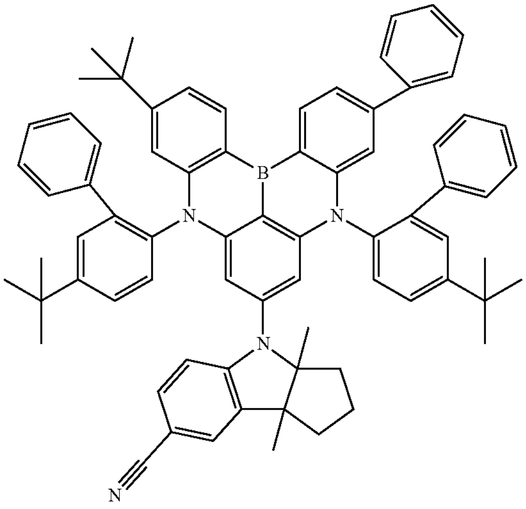
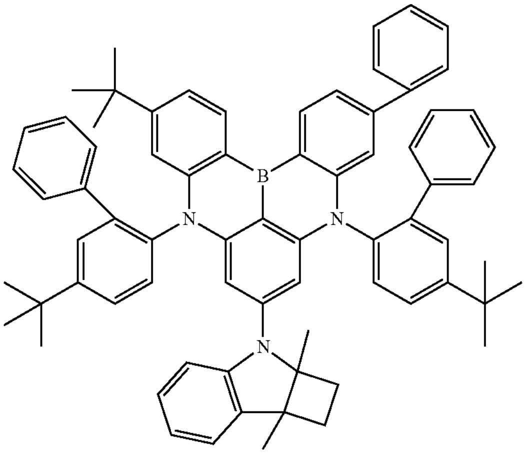
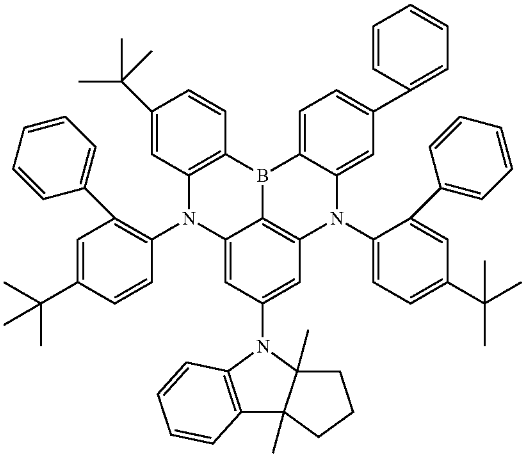

-continued
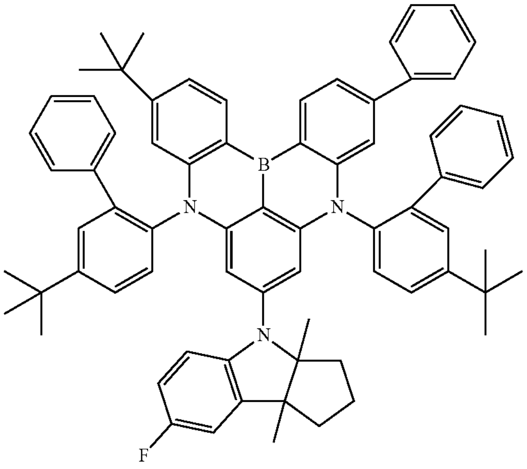
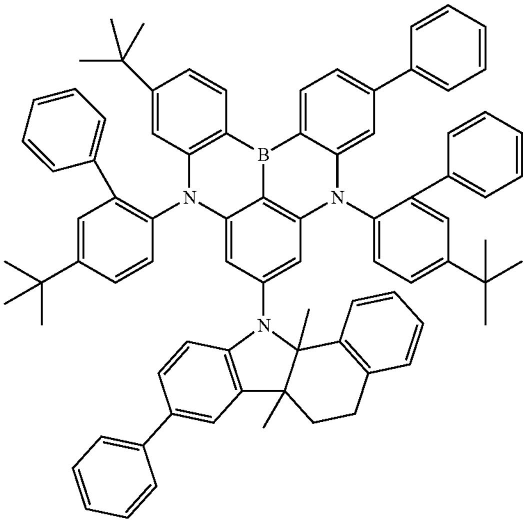
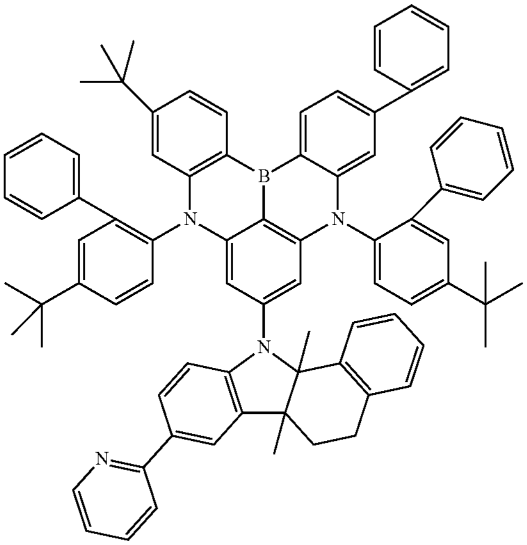
-continued
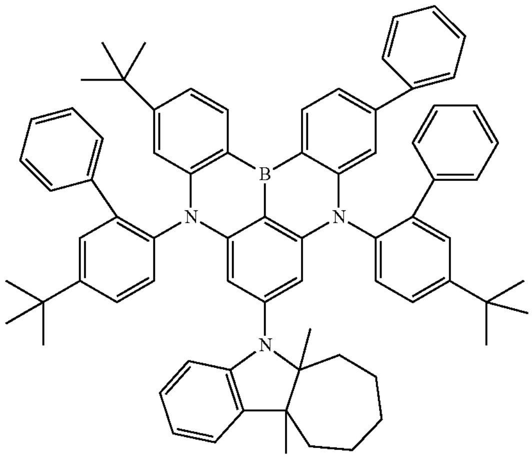
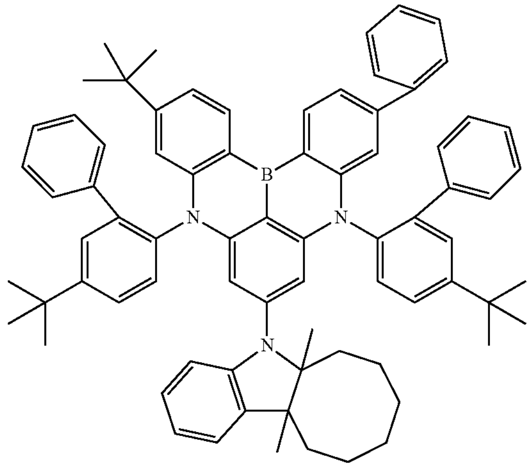
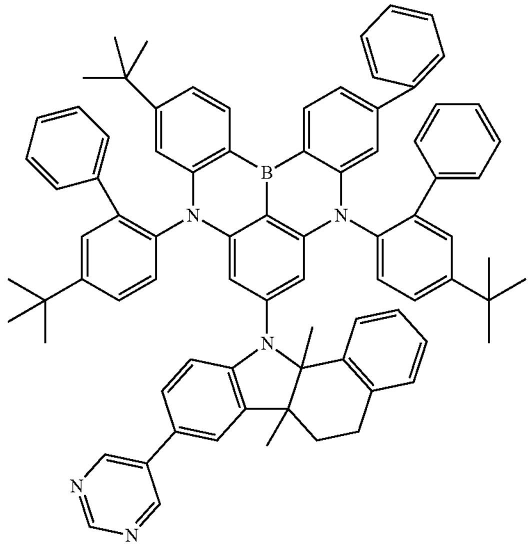

-continued
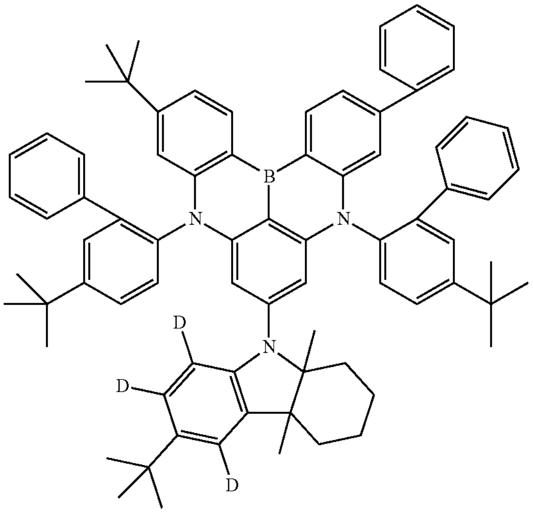
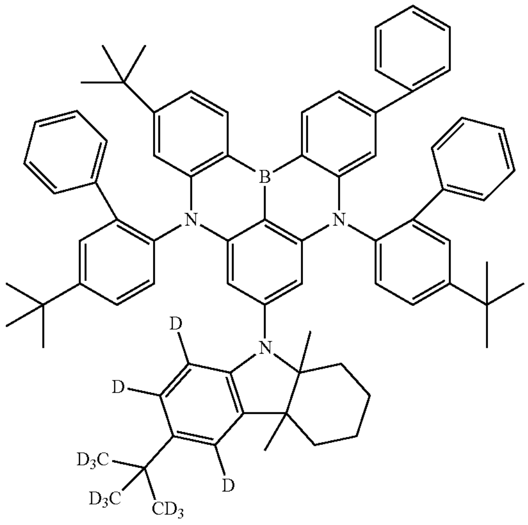
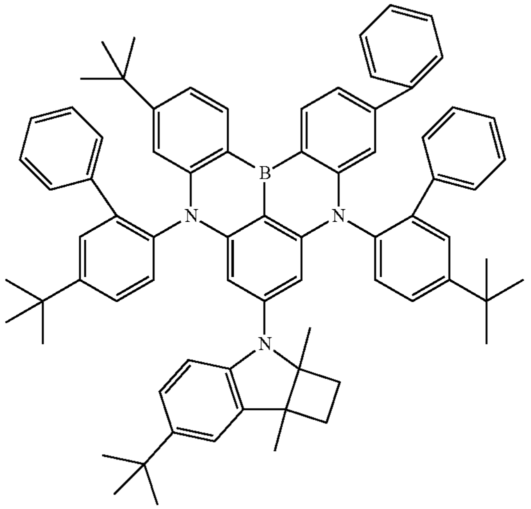
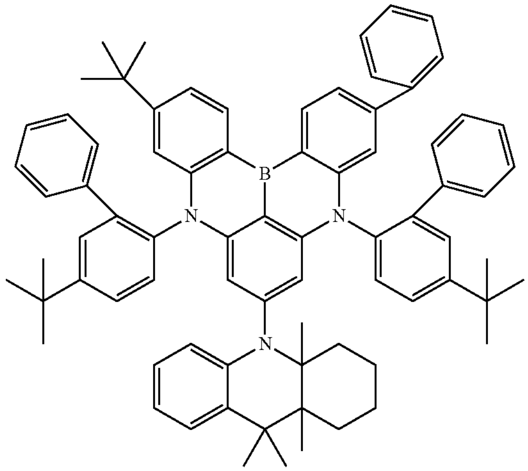
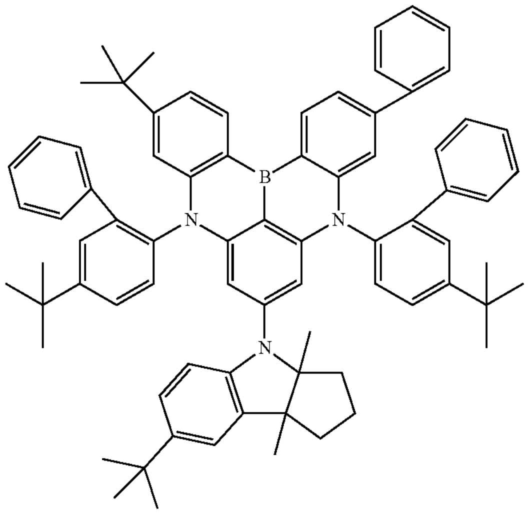
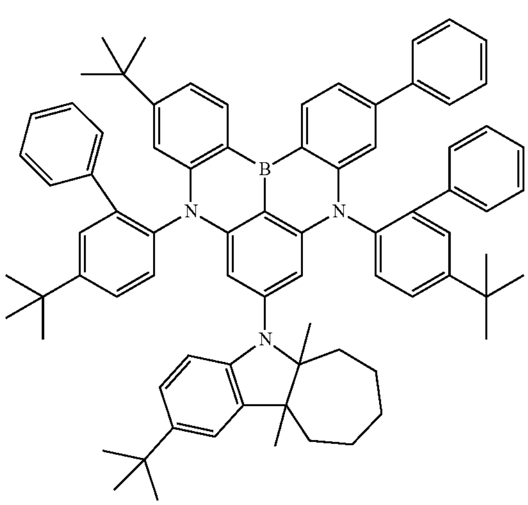

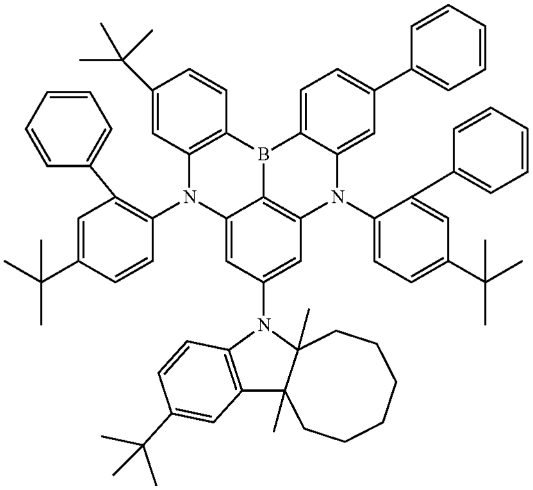
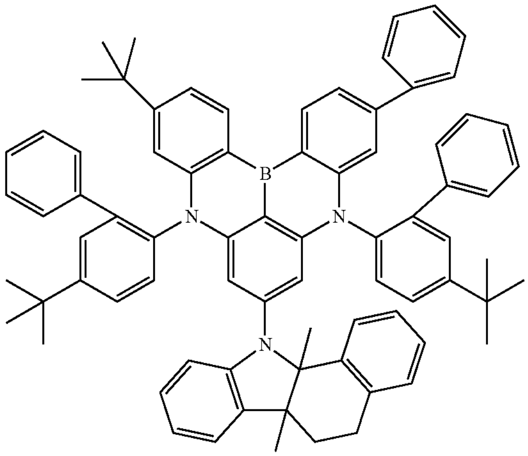
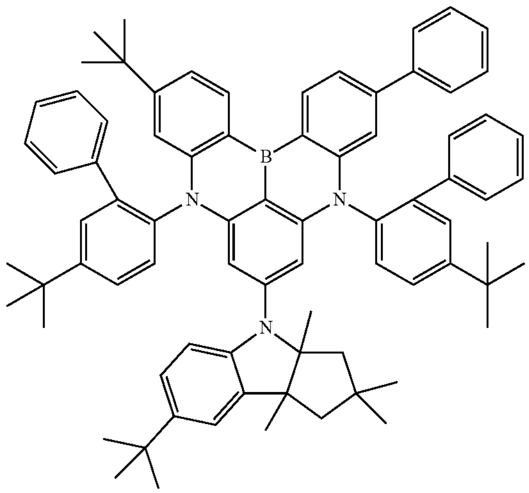
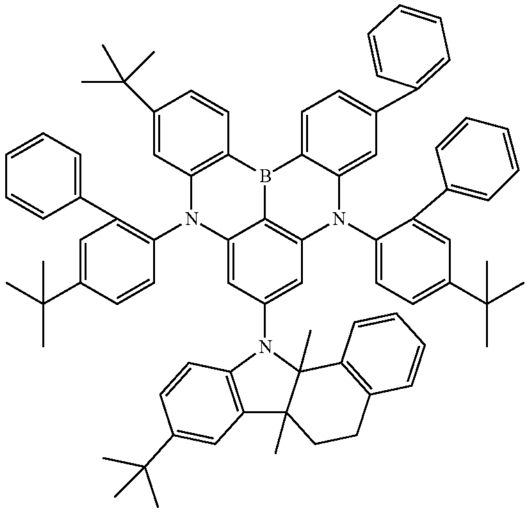
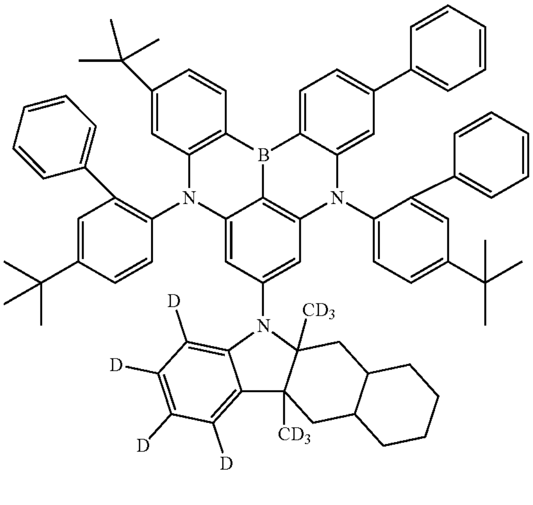
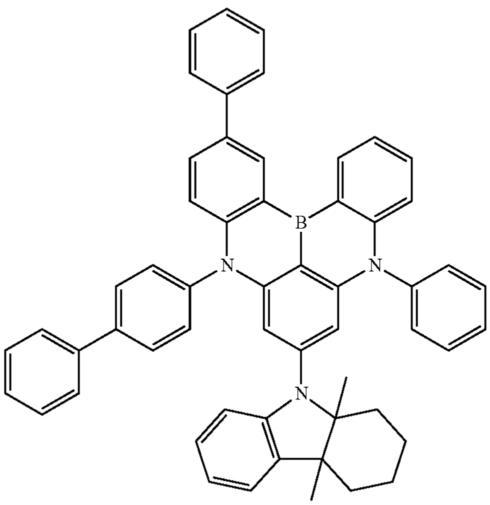

-continued
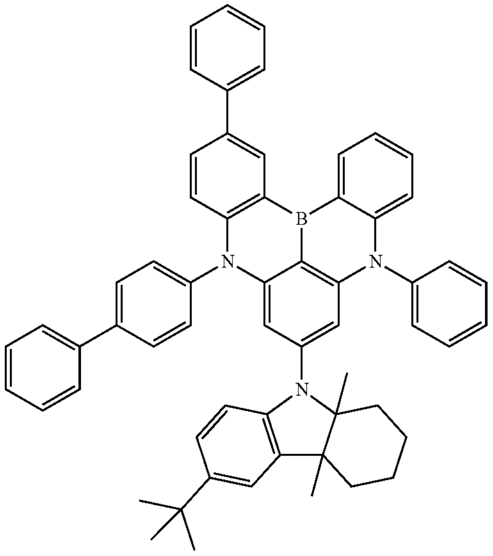
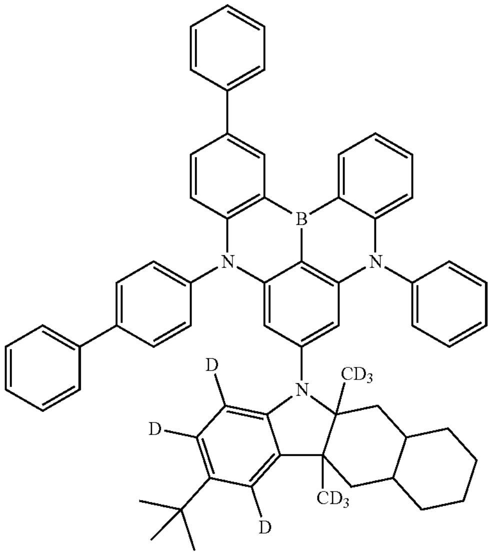
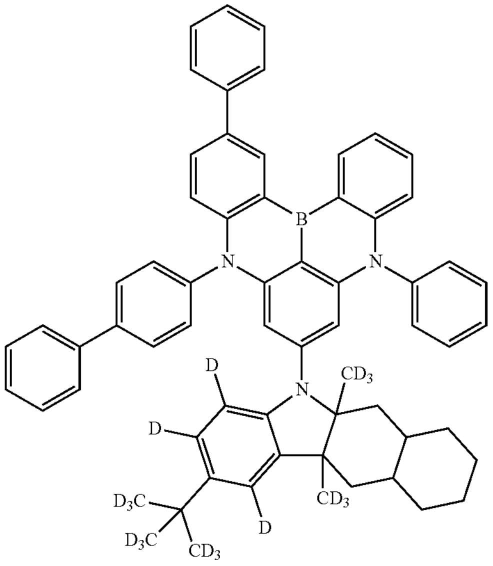
-continued
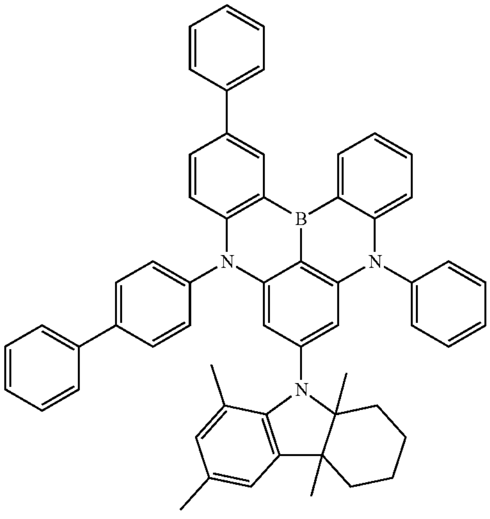
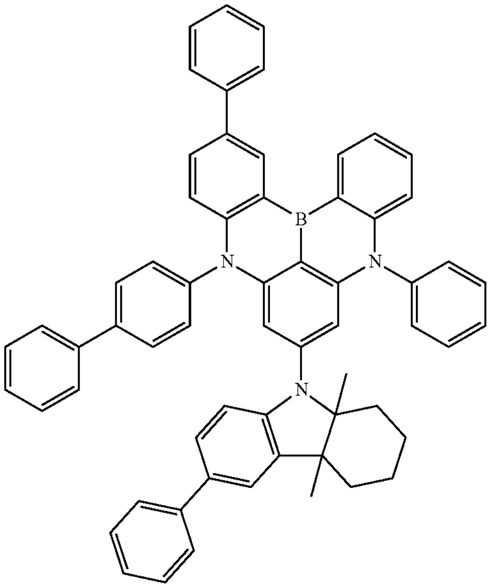
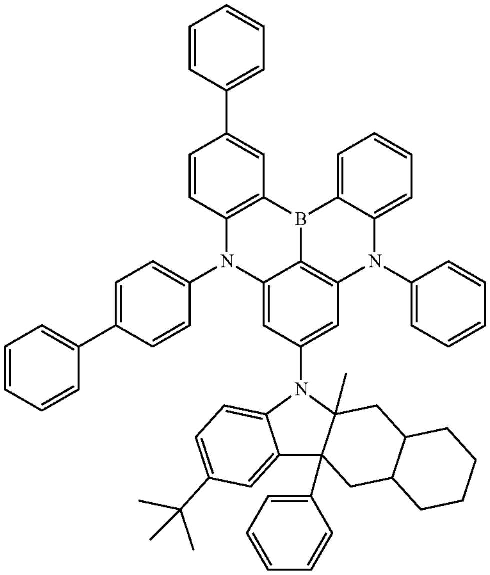

-continued
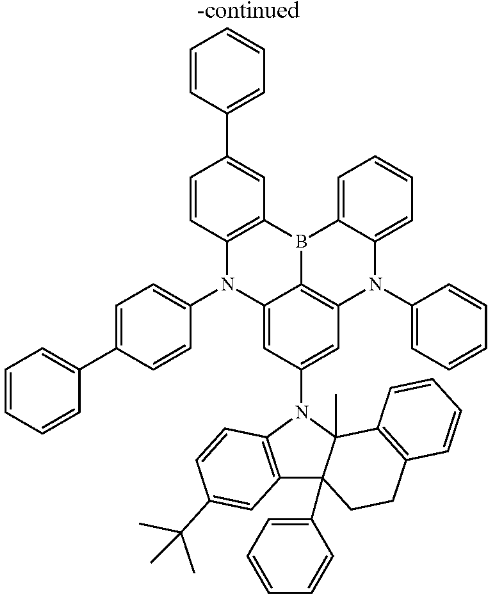
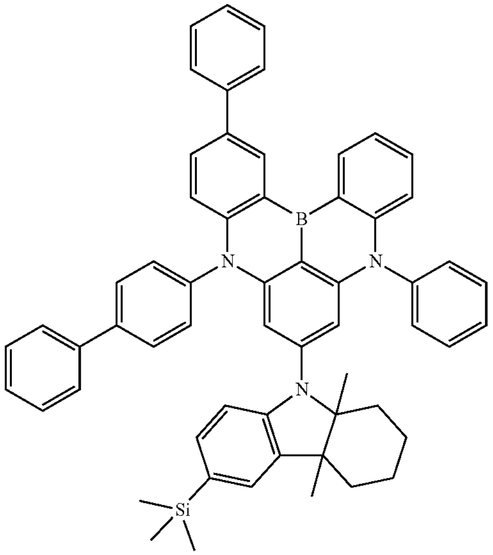
-continued
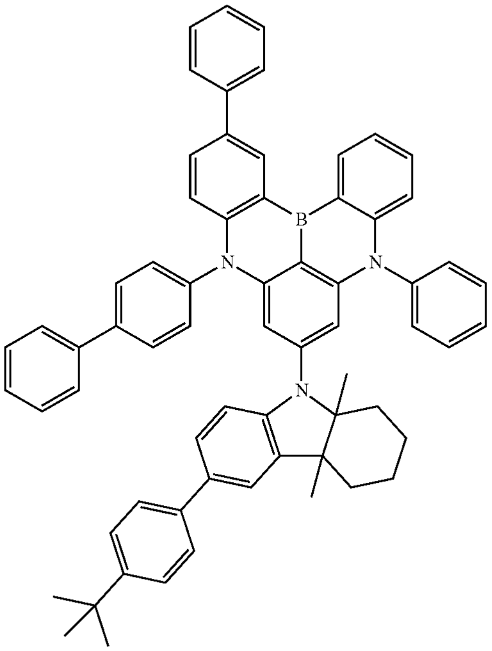
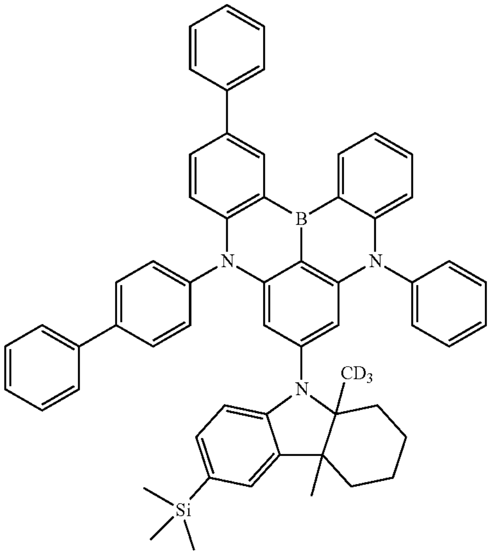

-continued
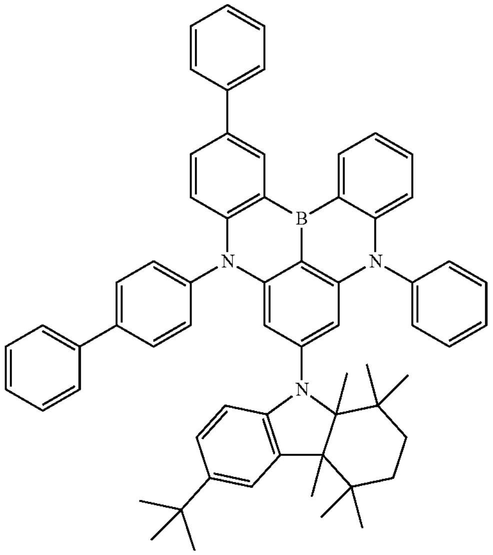
-continued
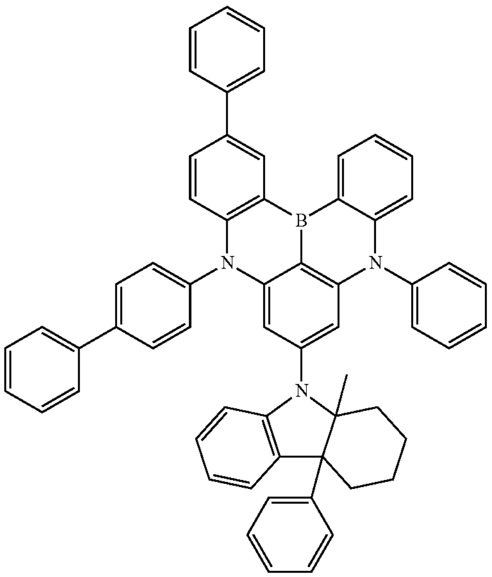
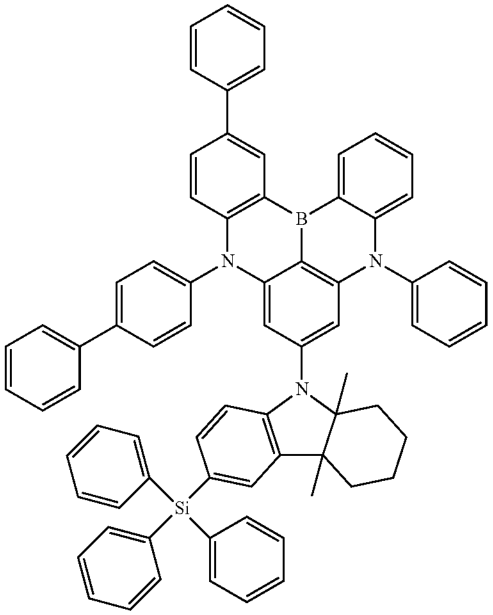
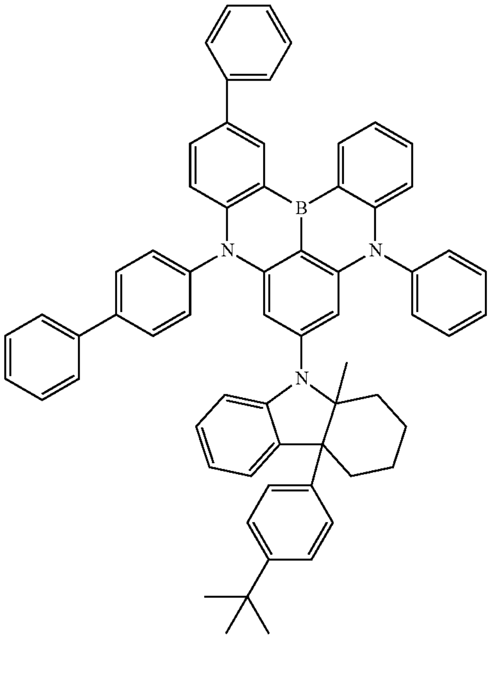

-continued
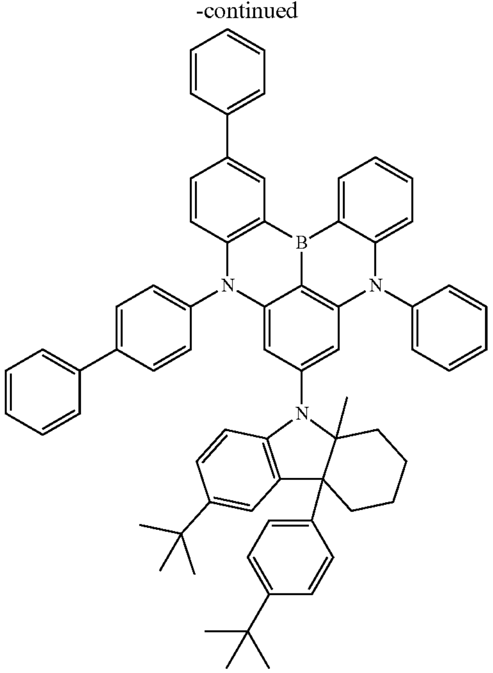
-continued
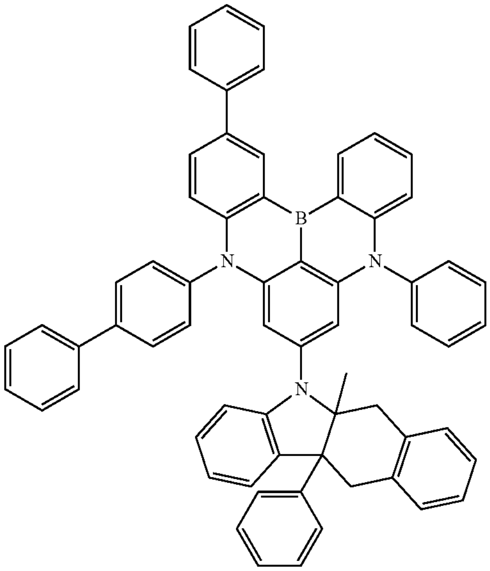
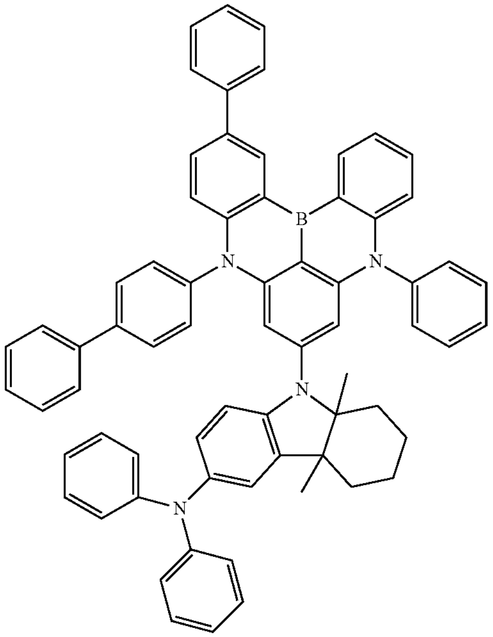
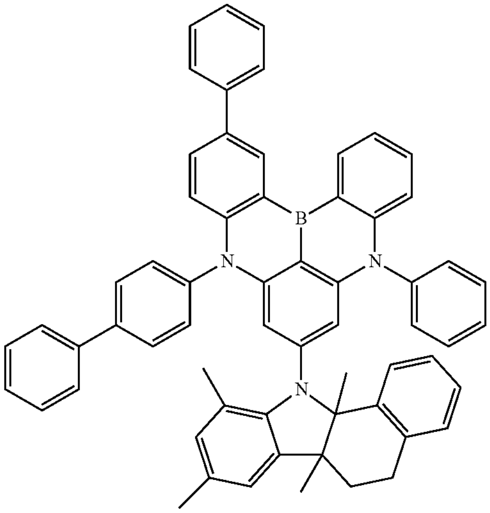

-continued
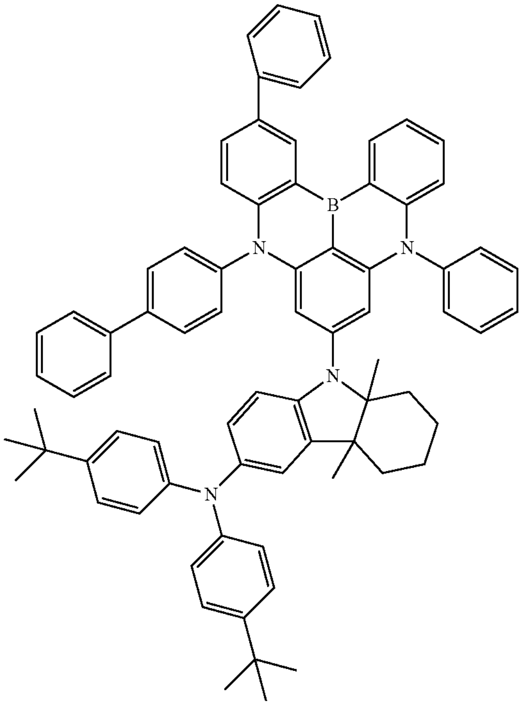
-continued
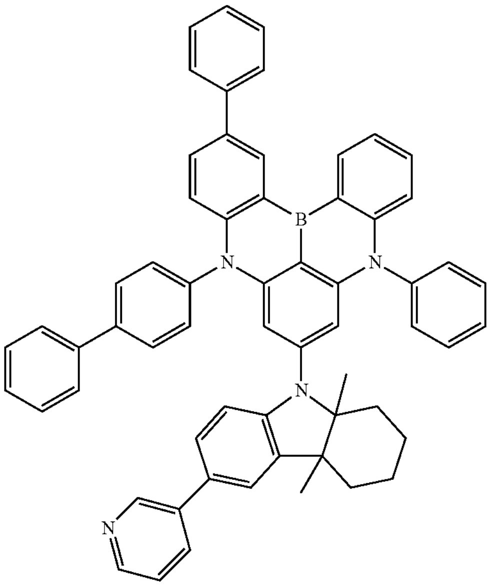
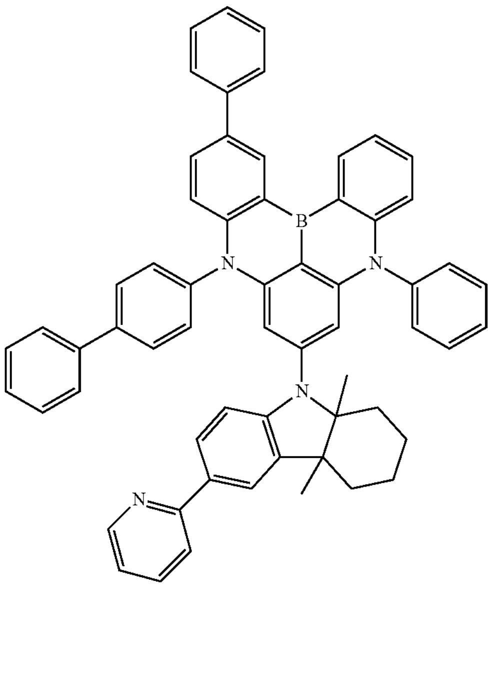
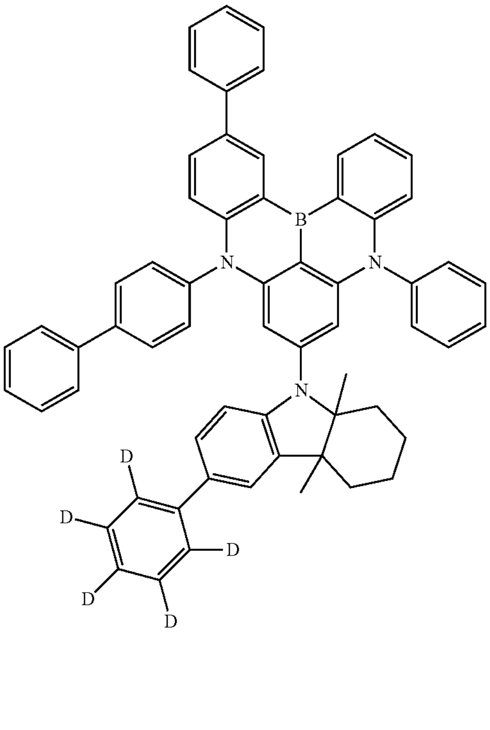

-continued
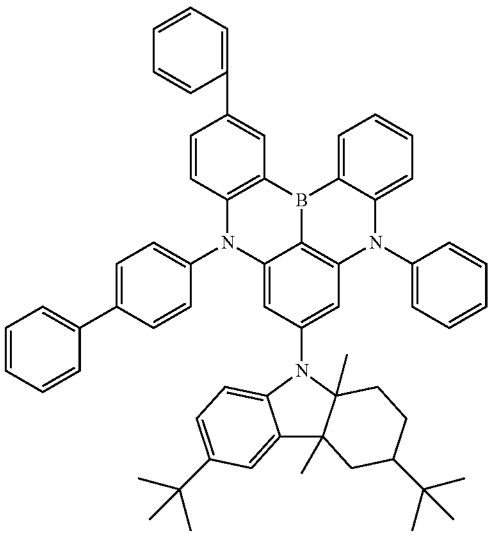
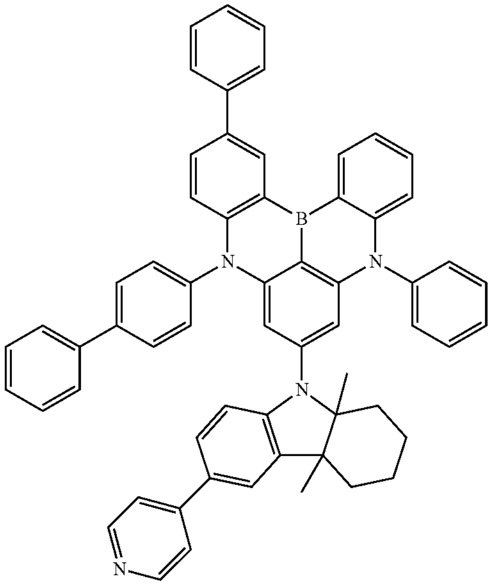
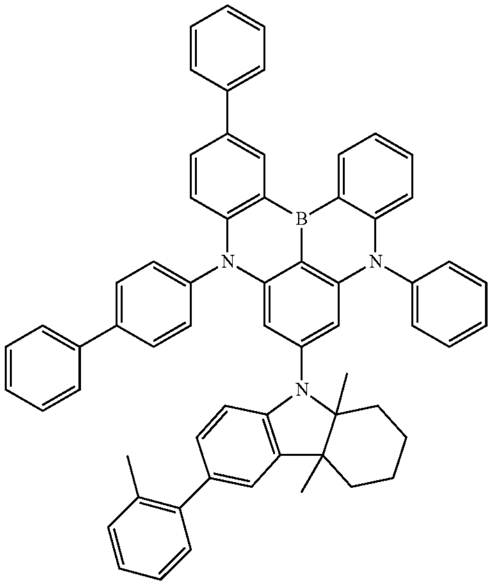
-continued
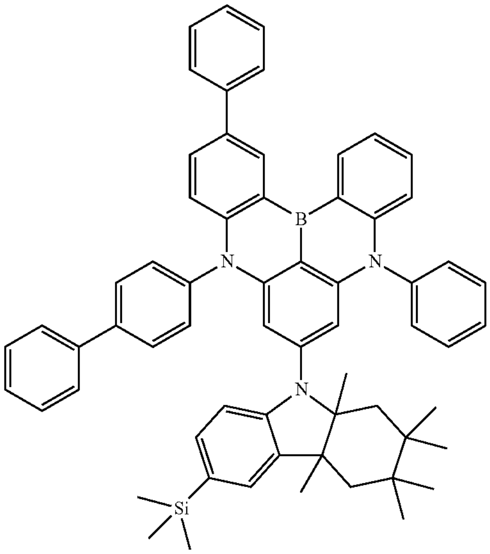
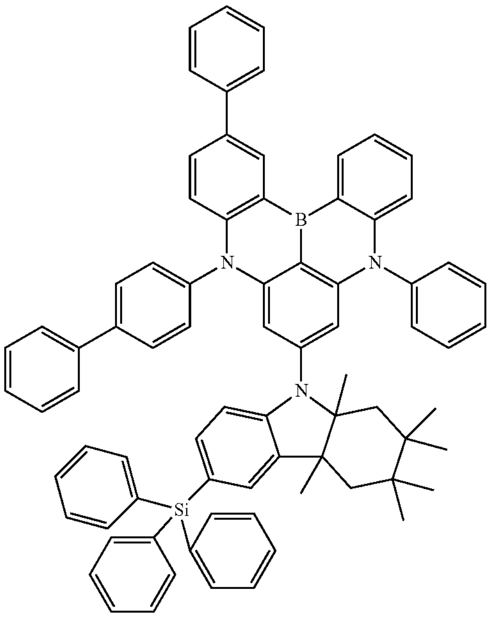
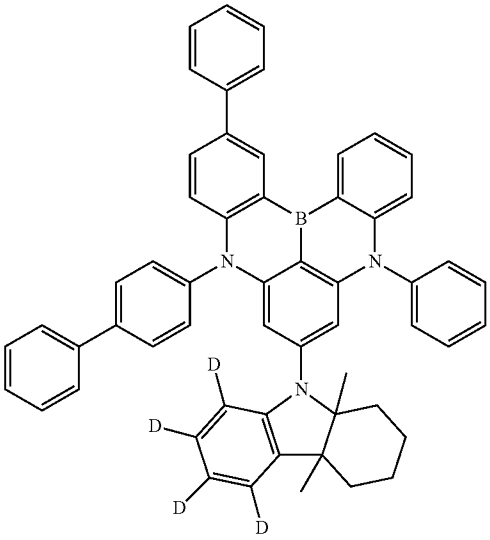

-continued
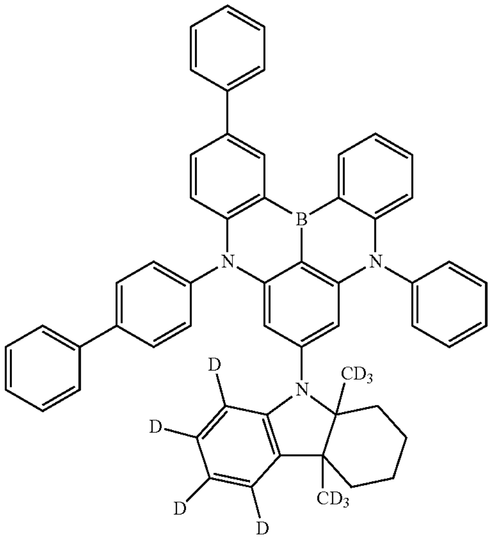
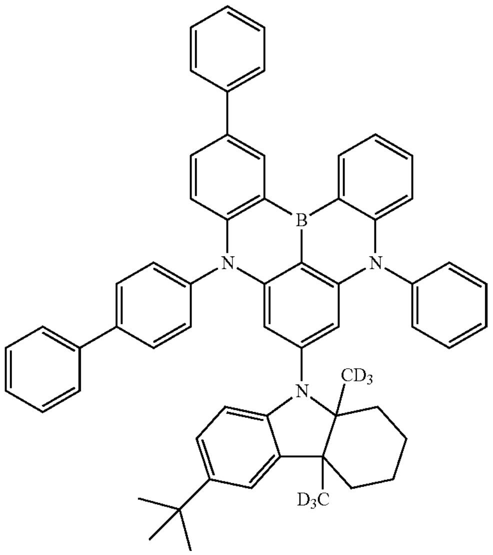
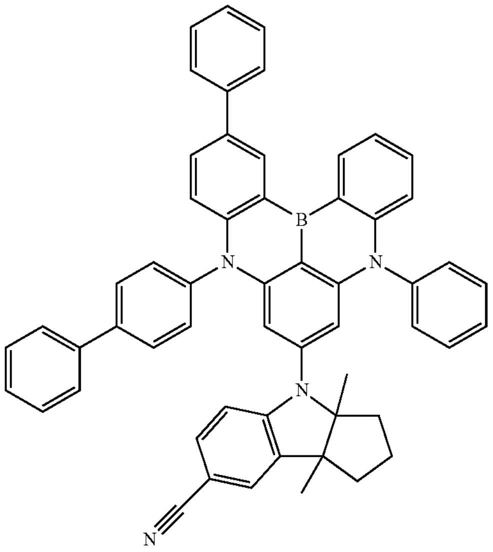
-continued
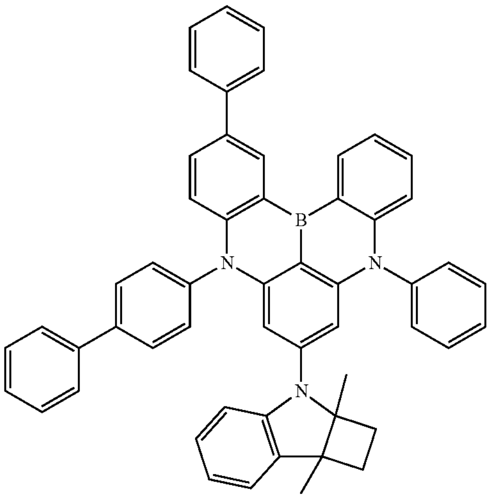
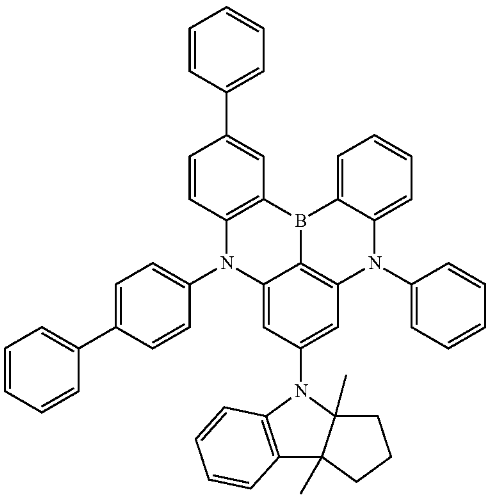
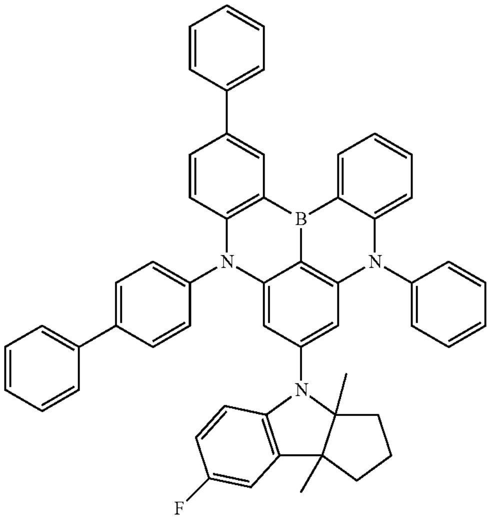

-continued
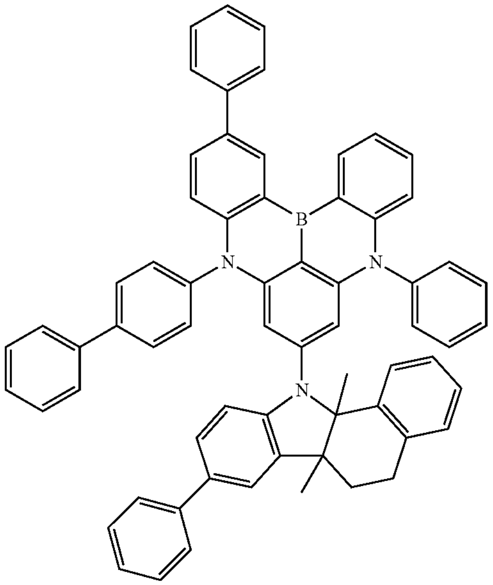
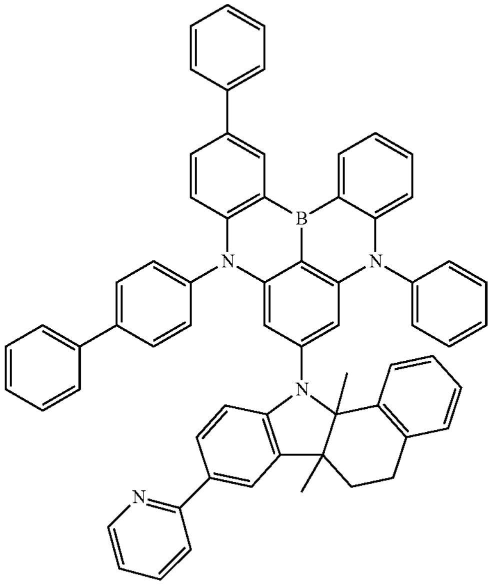
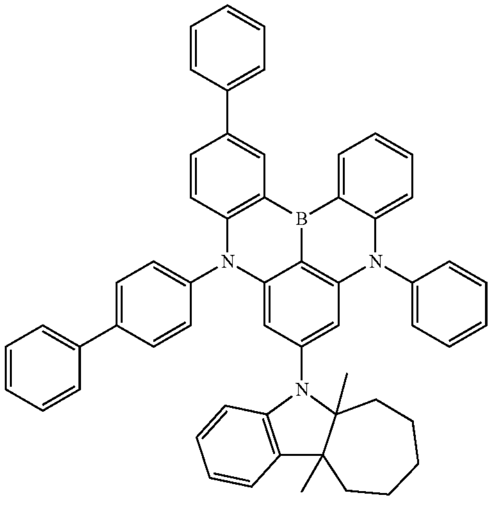
-continued
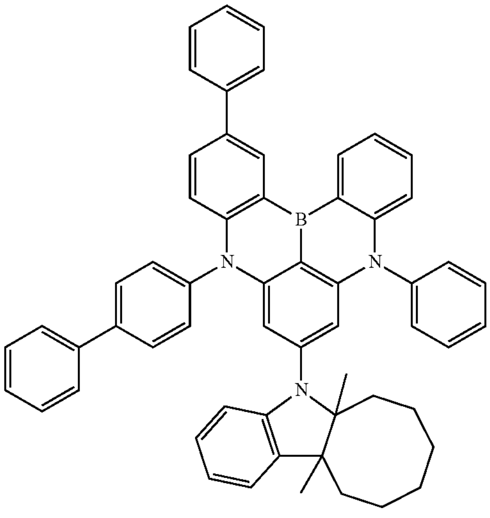
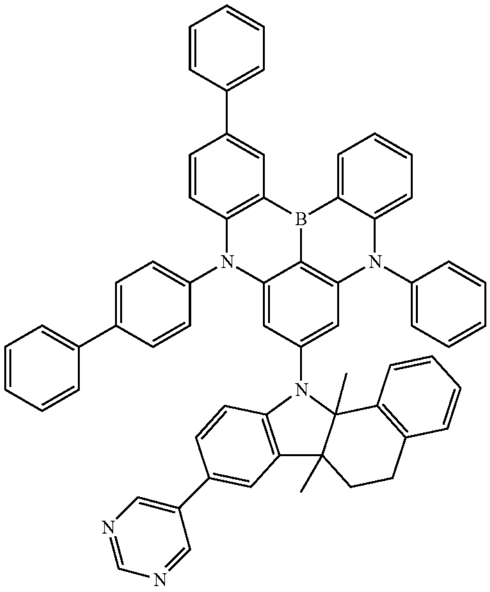
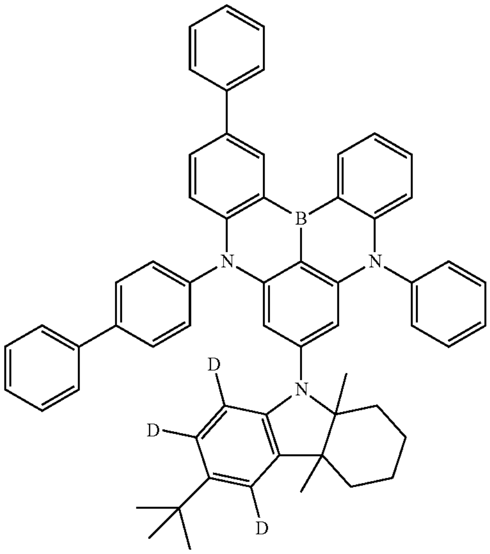

-continued
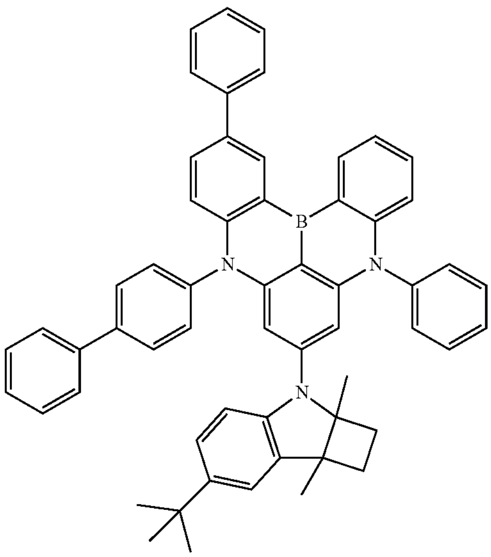
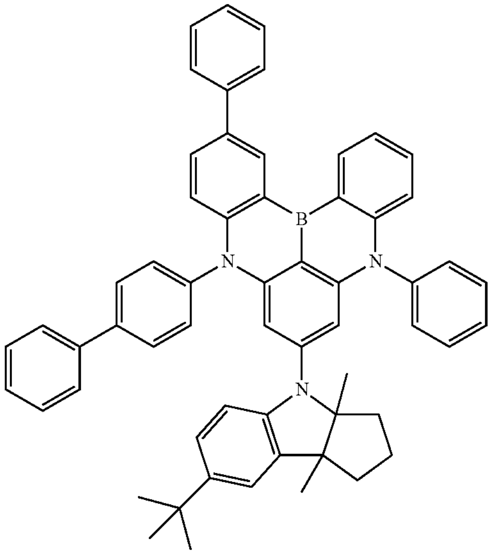
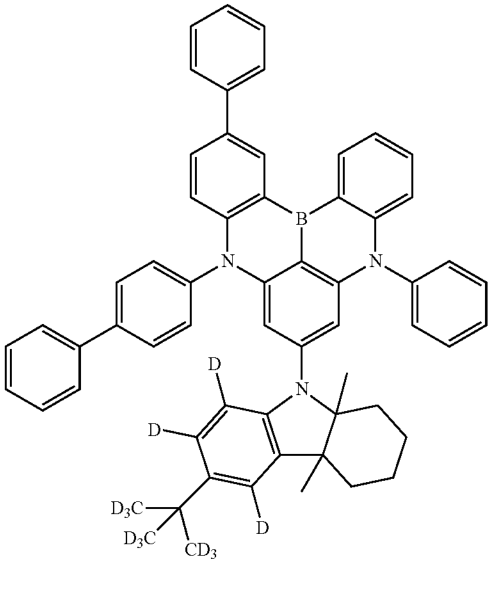
-continued
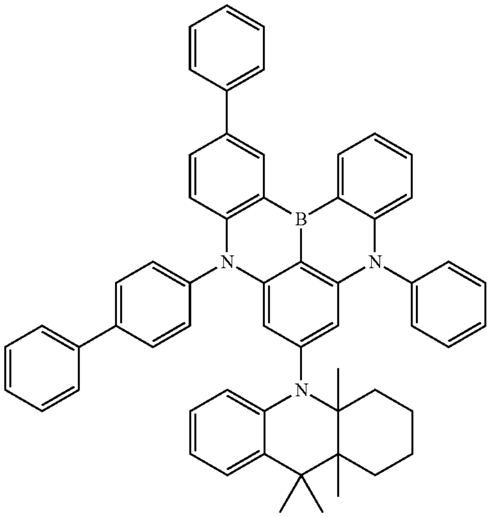
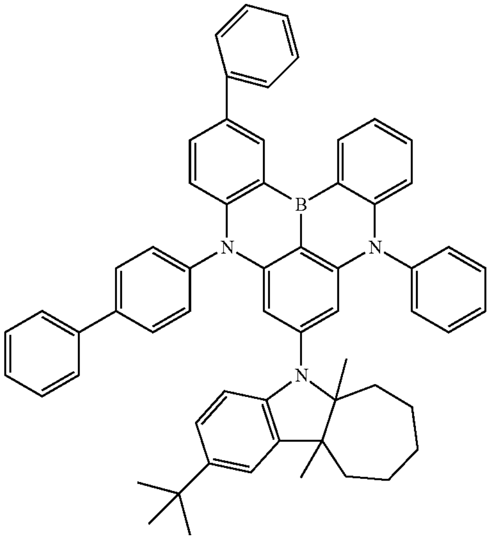
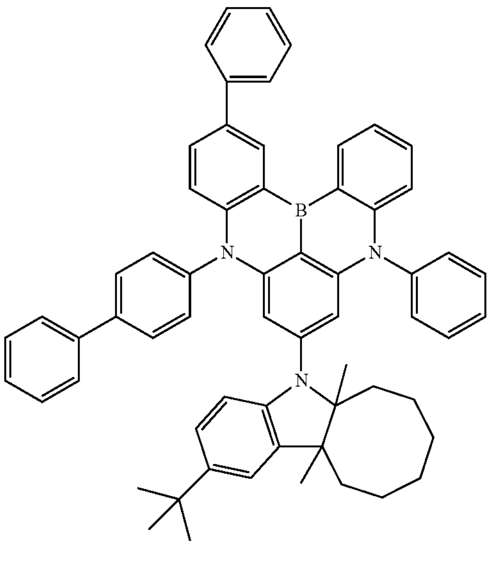

-continued
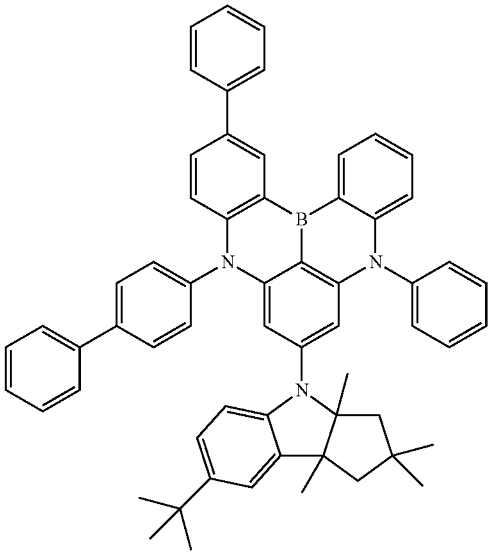
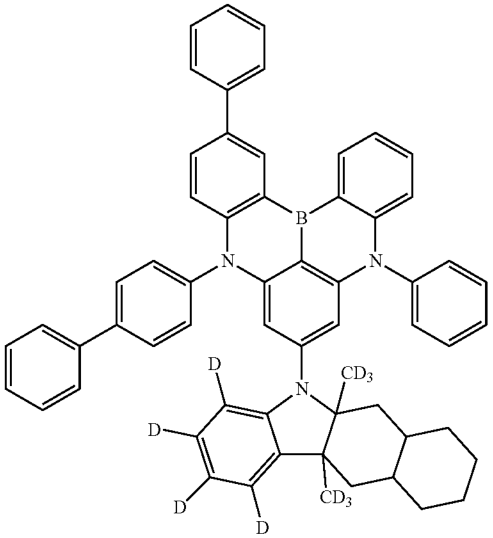
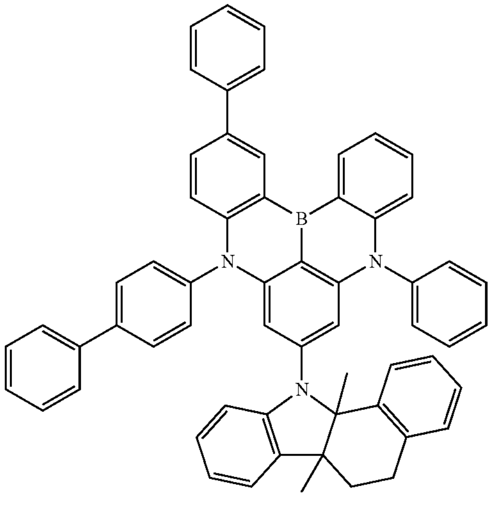
-continued
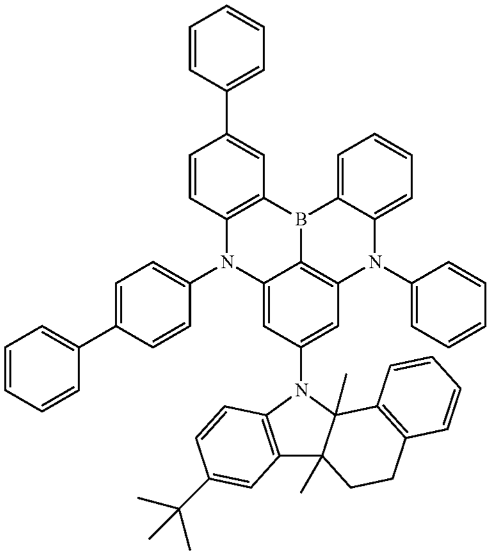
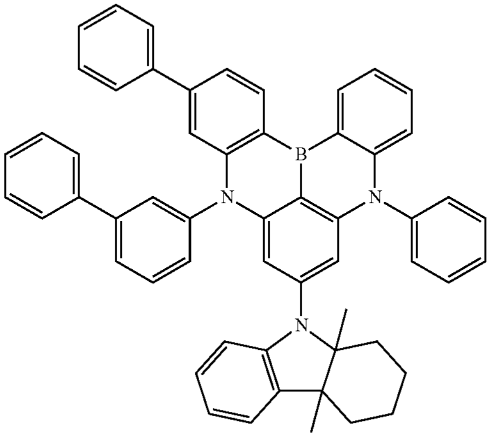
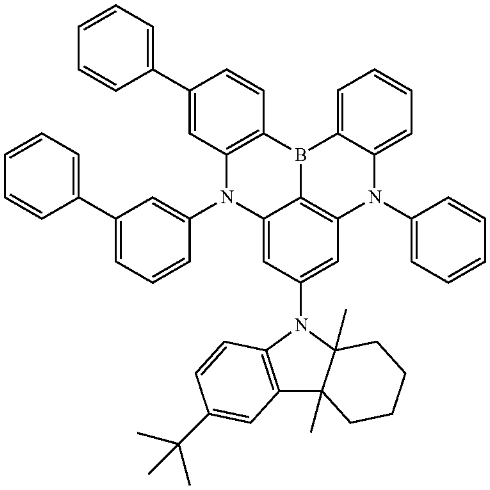

-continued
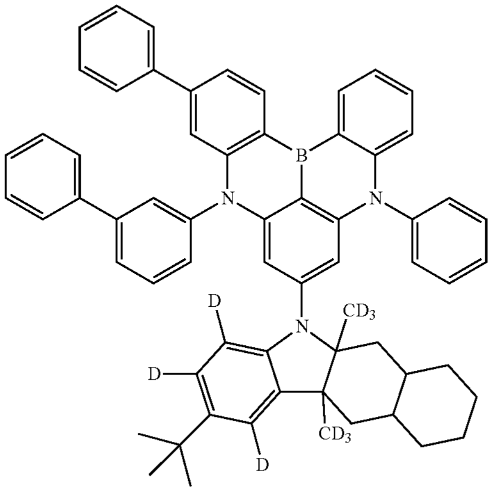
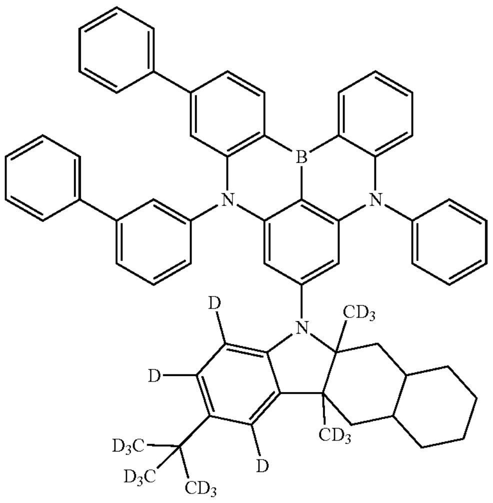
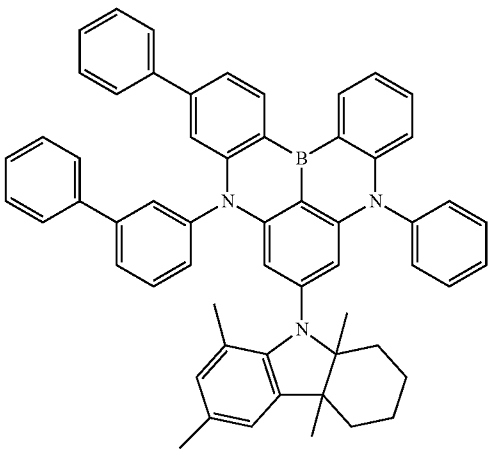
-continued
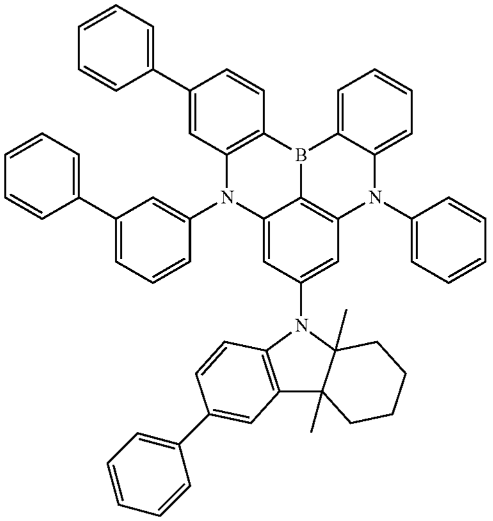
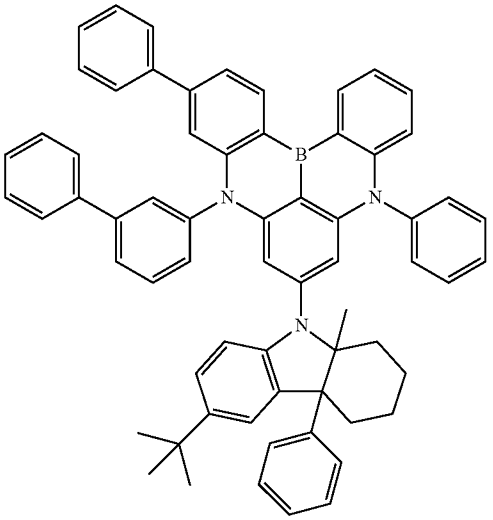
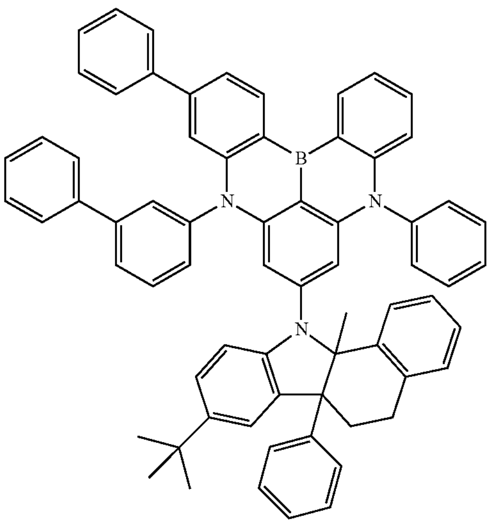

-continued
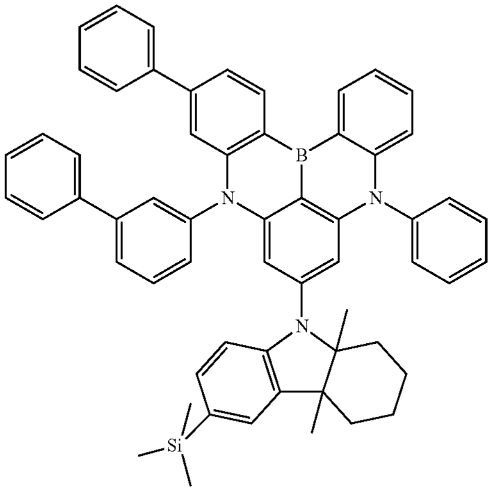
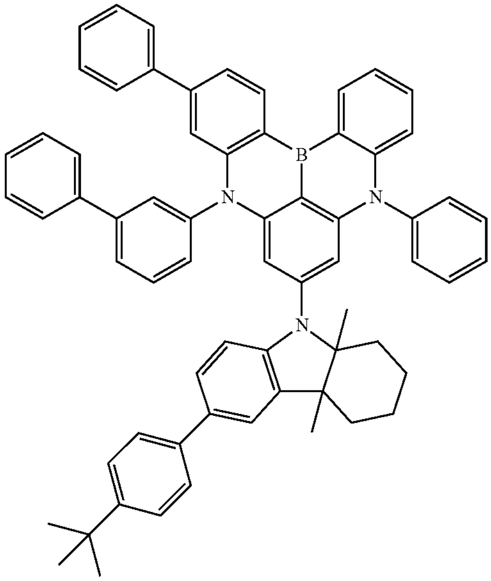
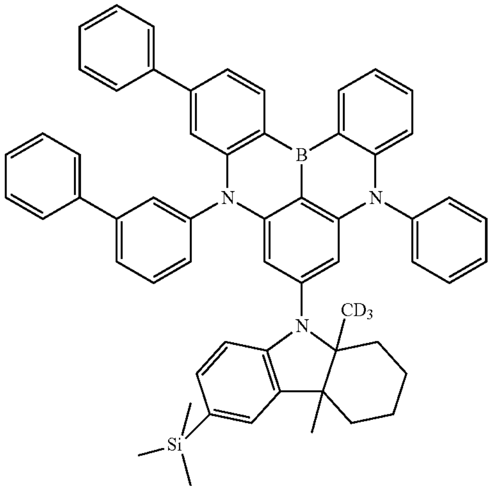
-continued
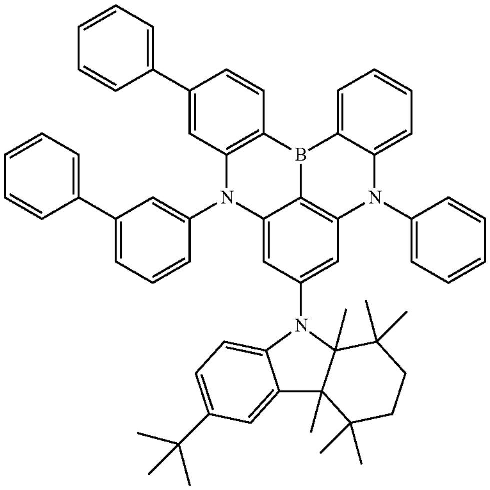
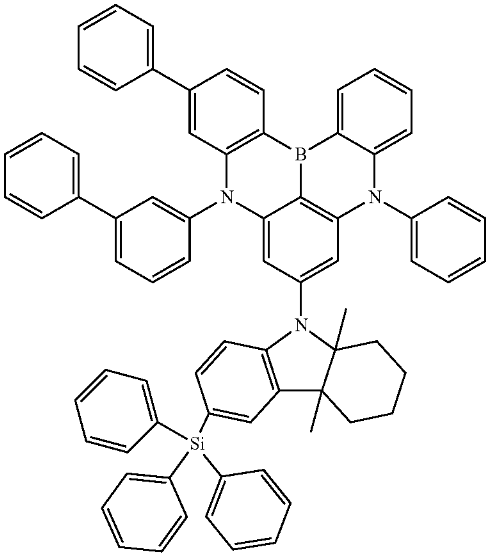
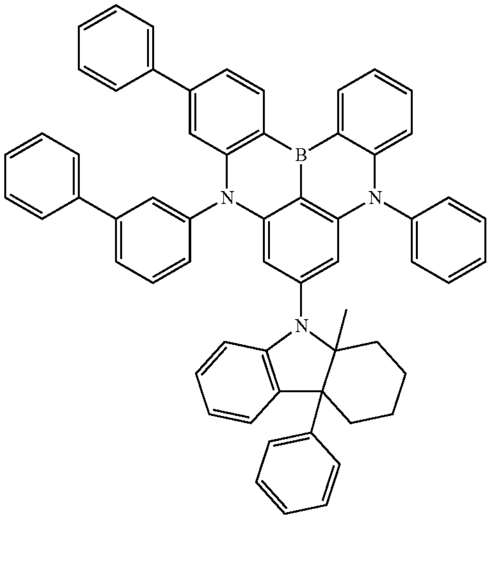

-continued
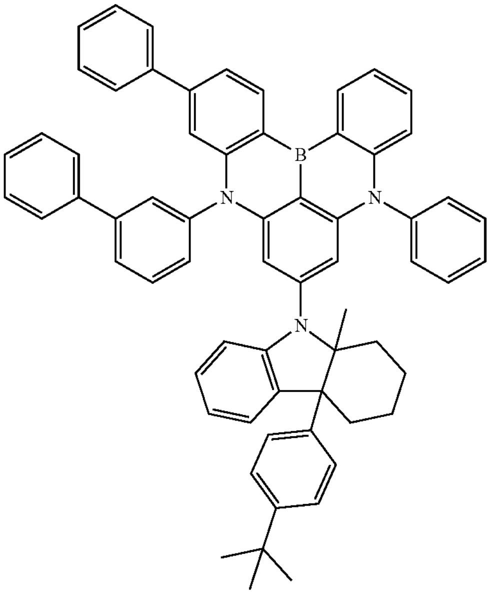
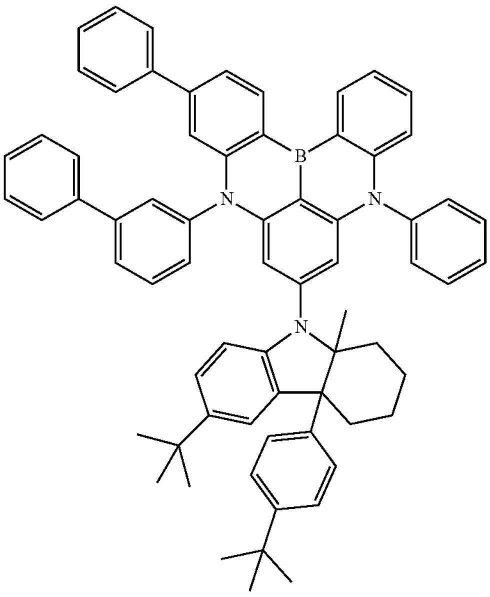
-continued
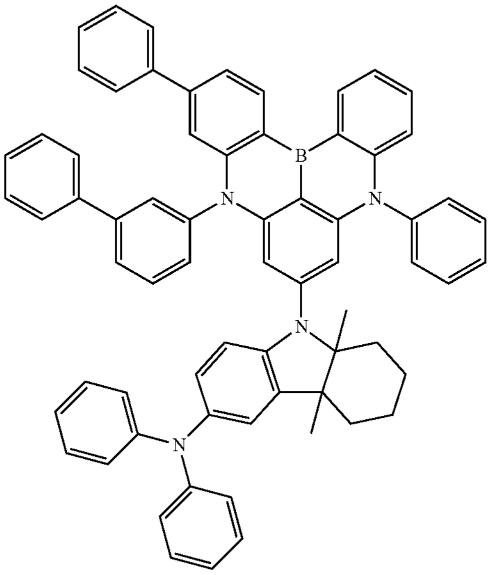
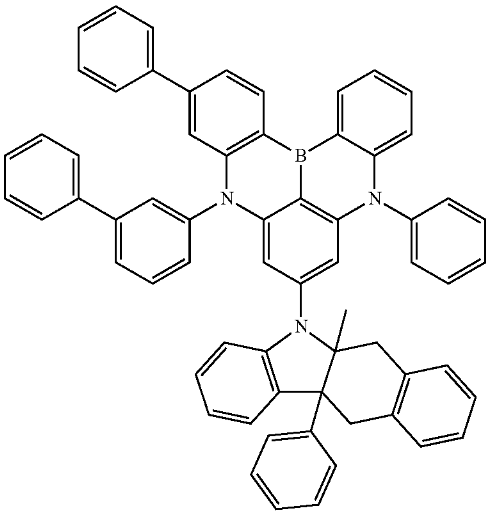
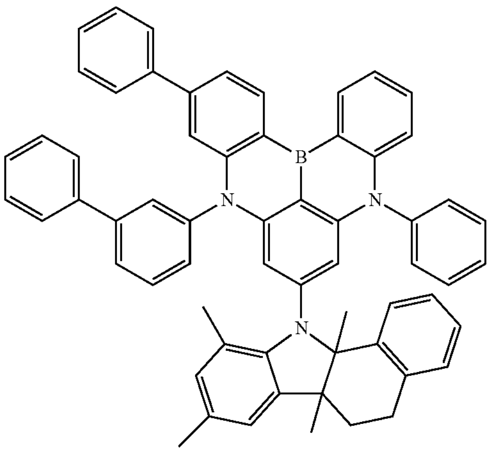

-continued
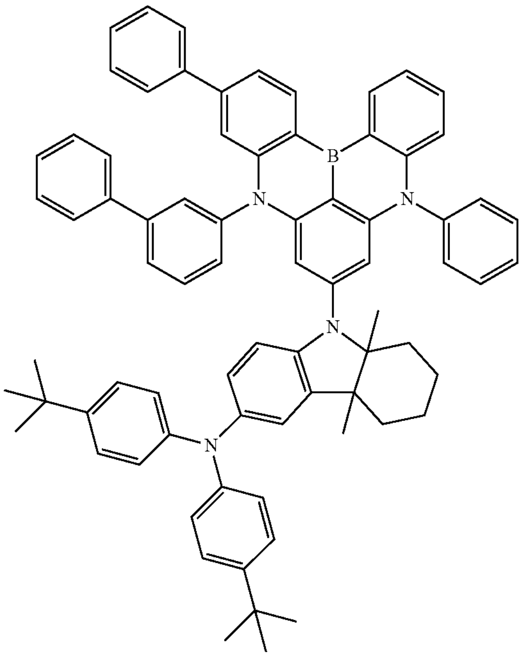
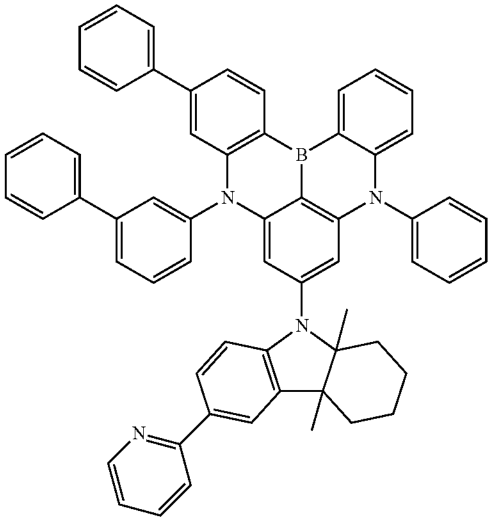
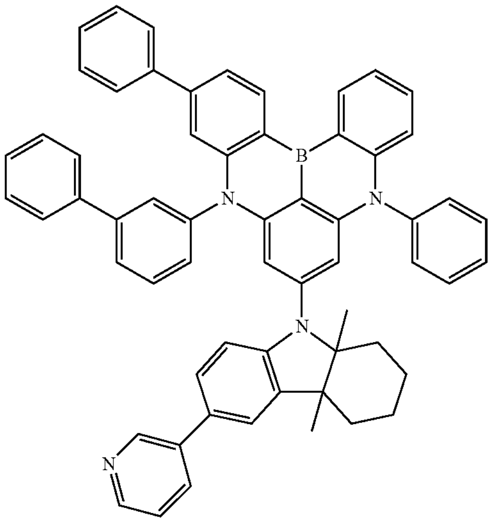
-continued
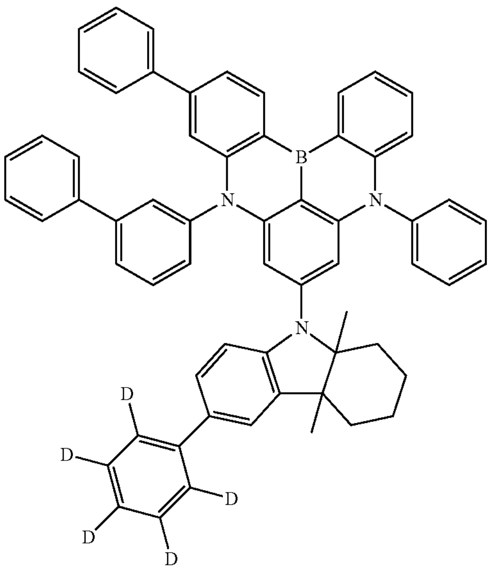
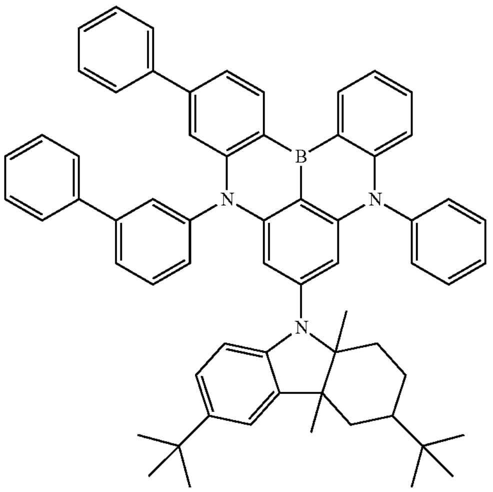
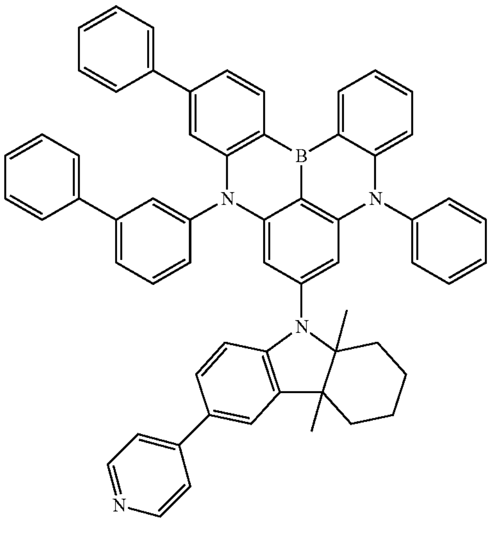

-continued
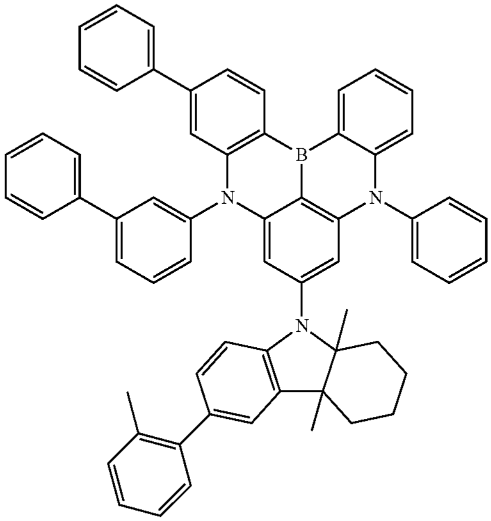
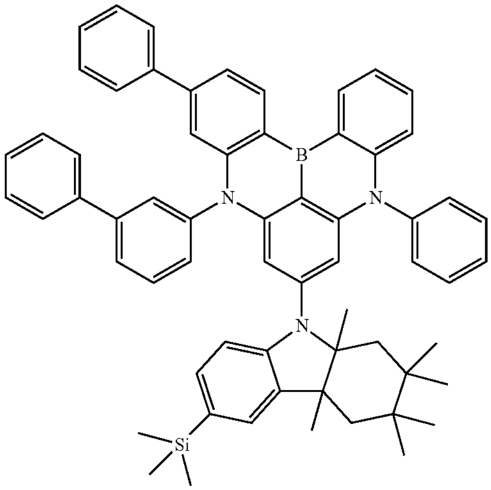
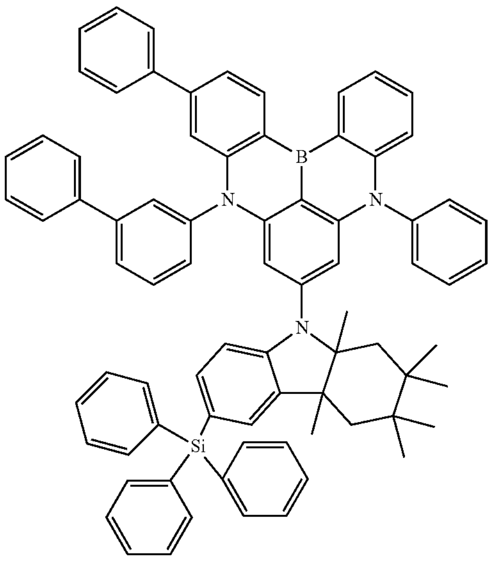
-continued
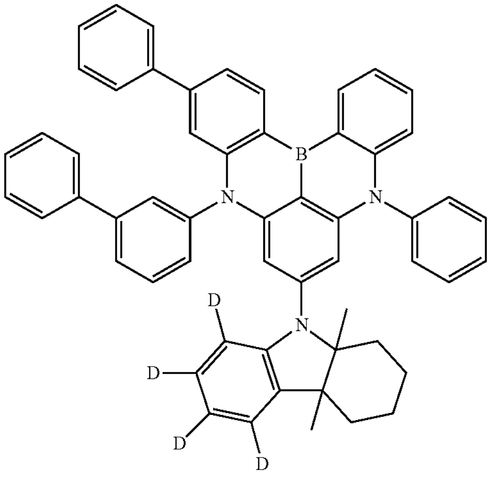
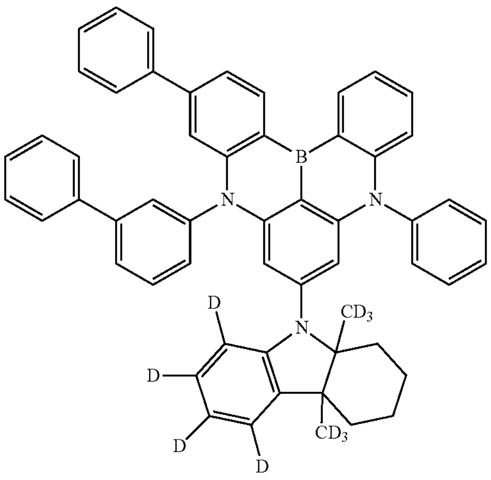
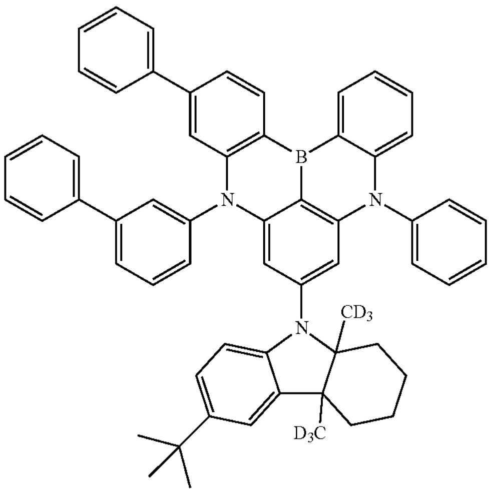

-continued
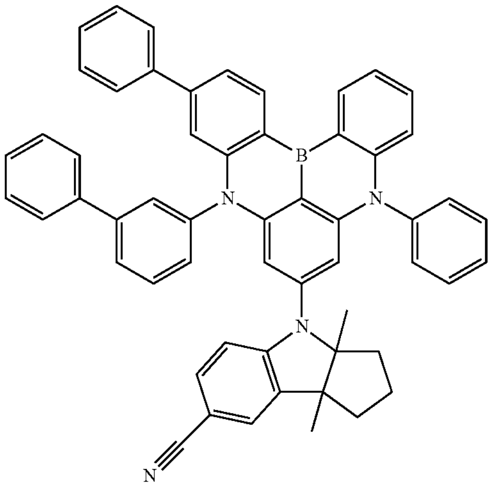
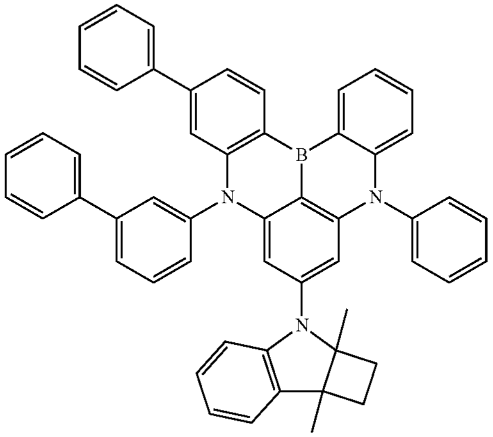
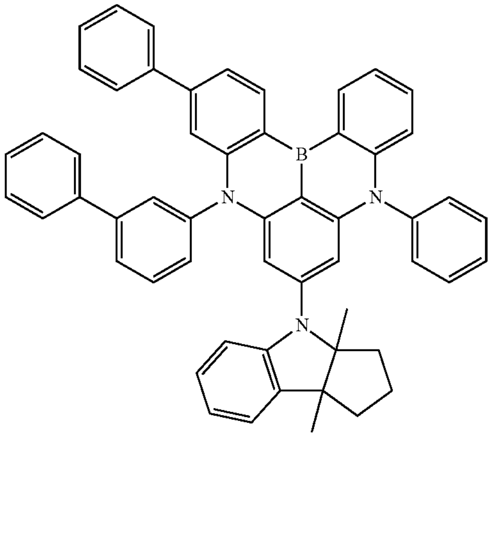
-continued
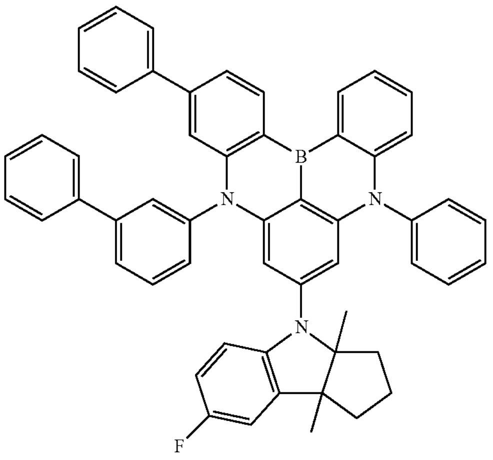
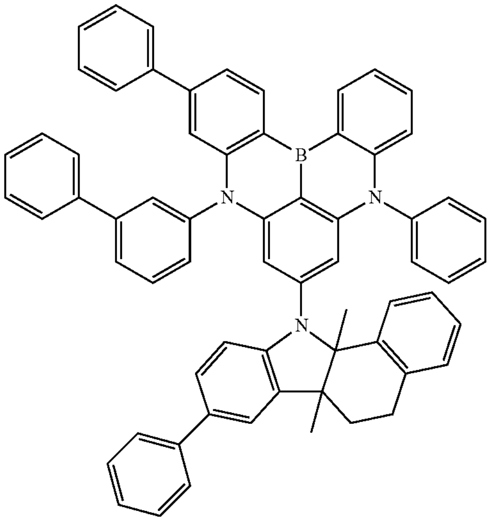
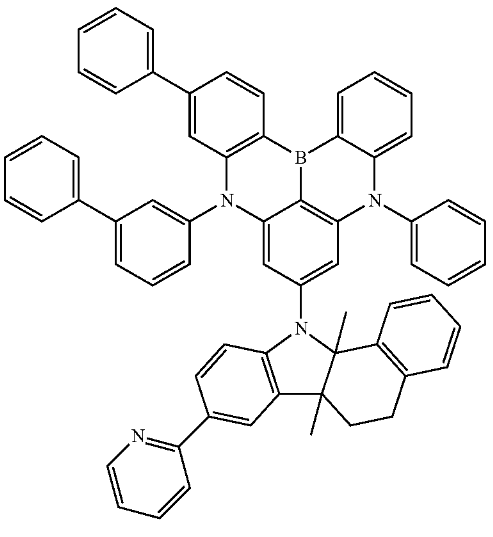

-continued
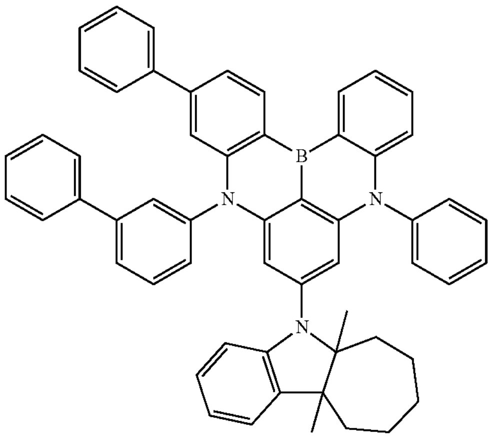
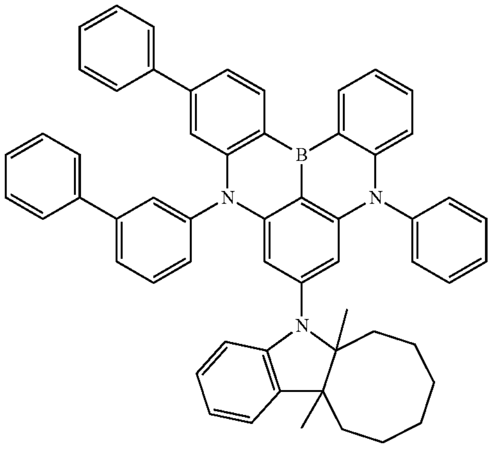
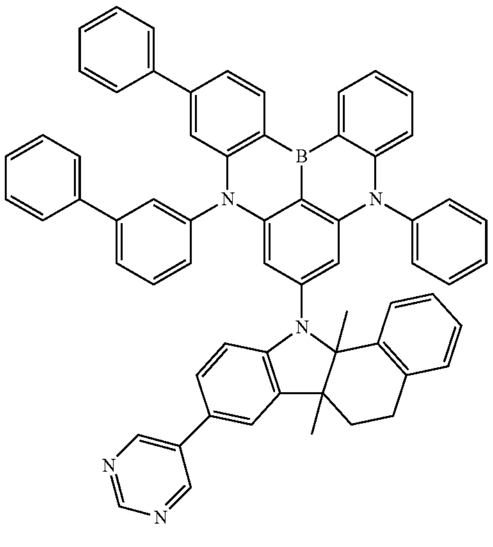
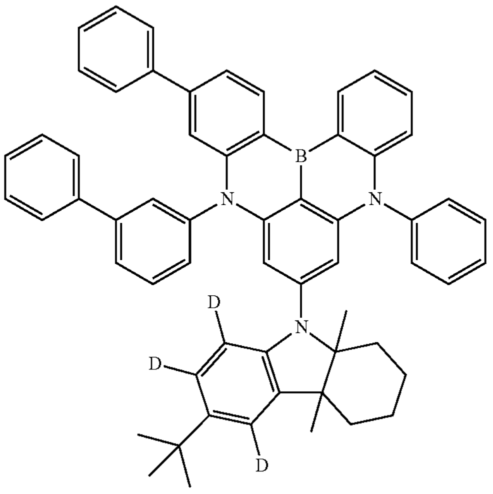
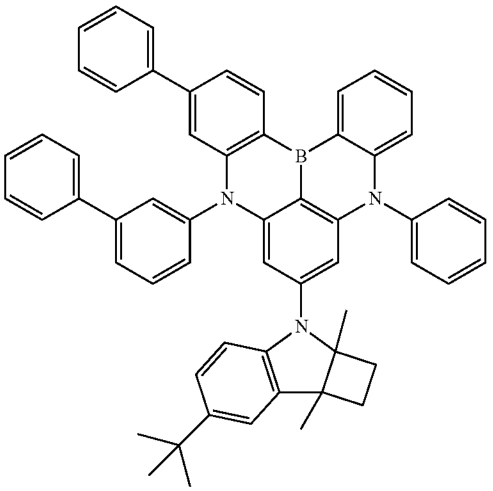
-continued
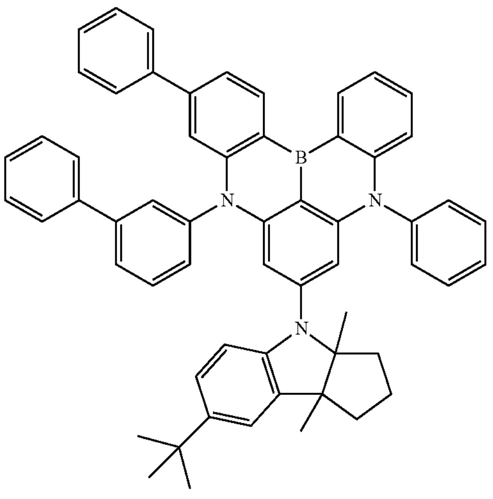

-continued
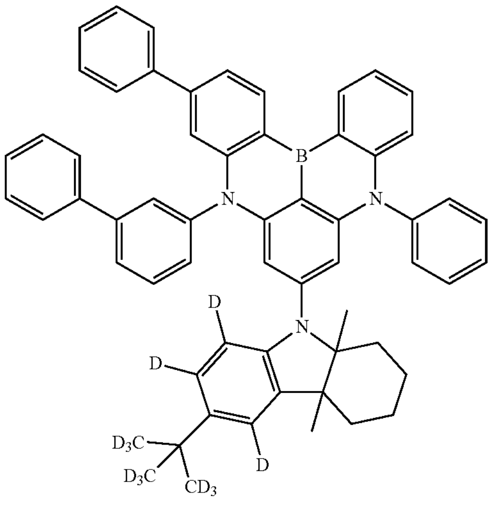
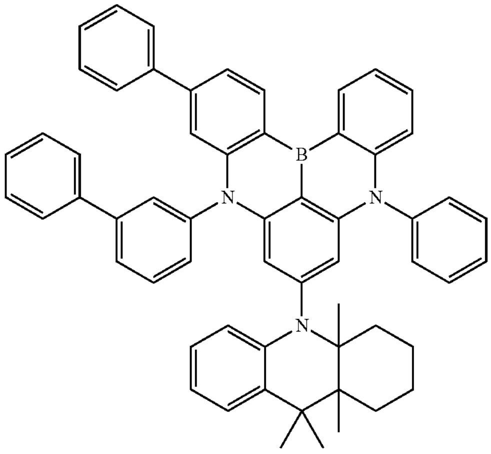
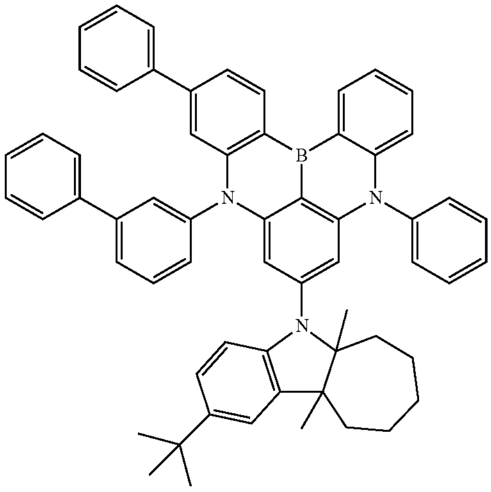
-continued
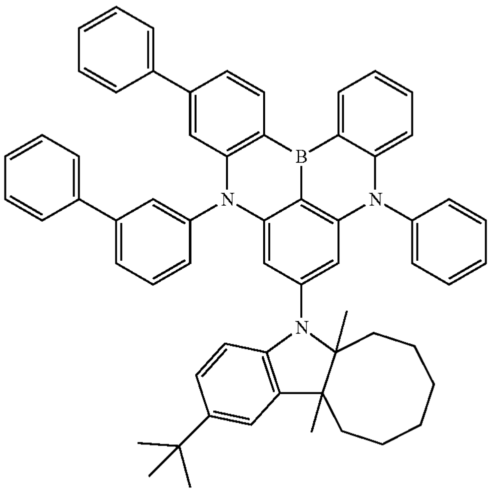
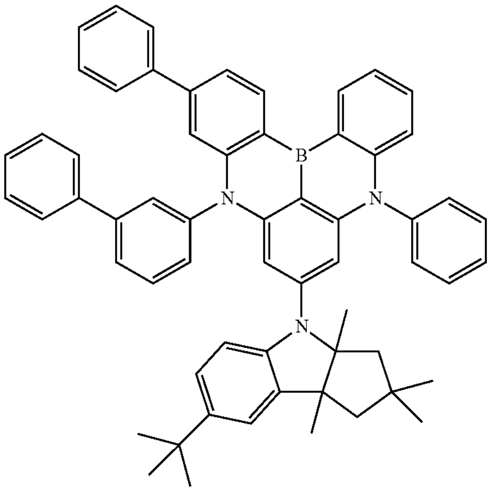
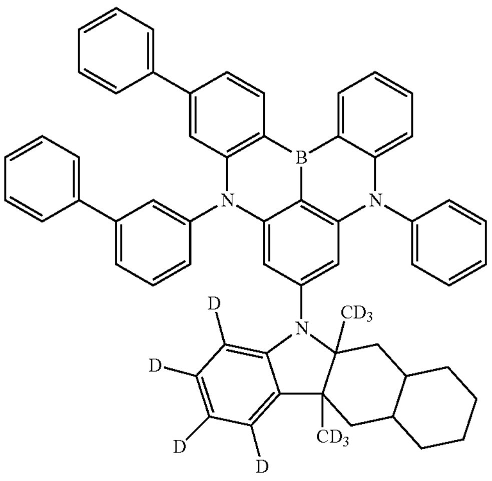

-continued
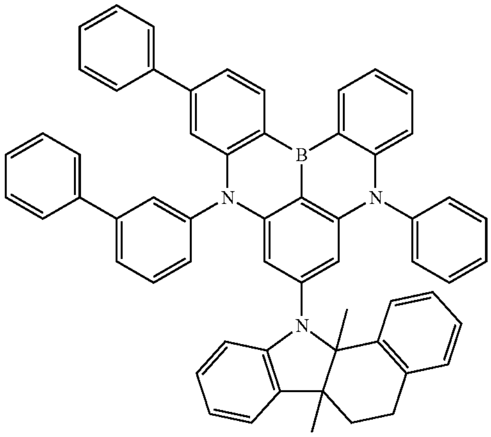
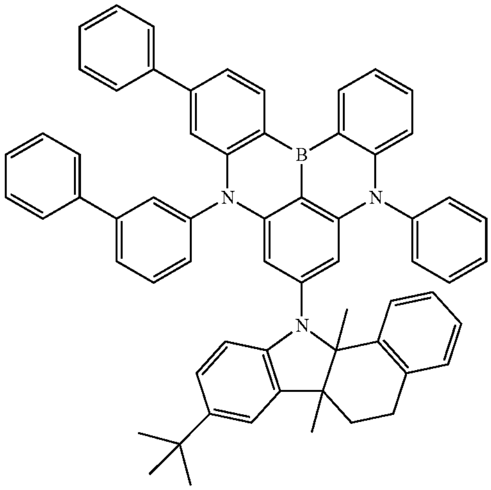
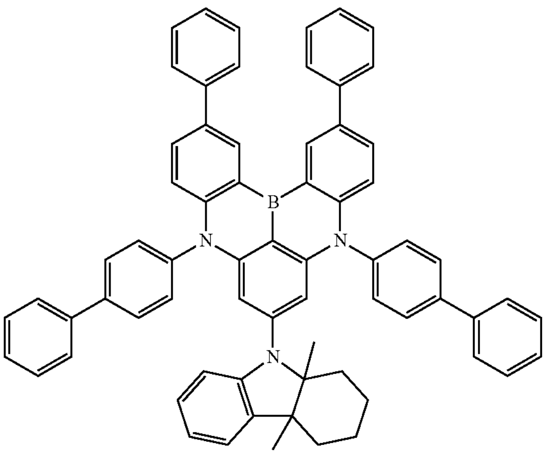
-continued
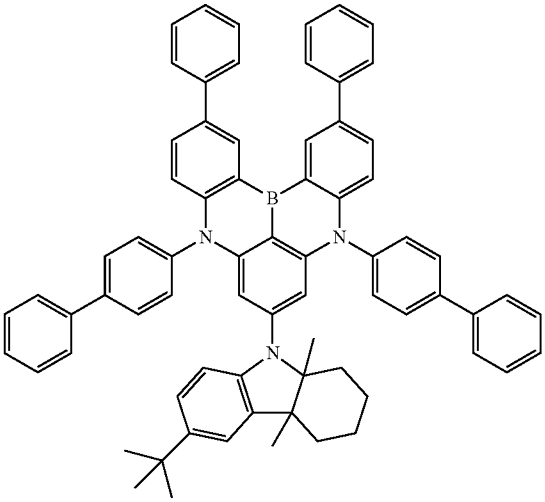
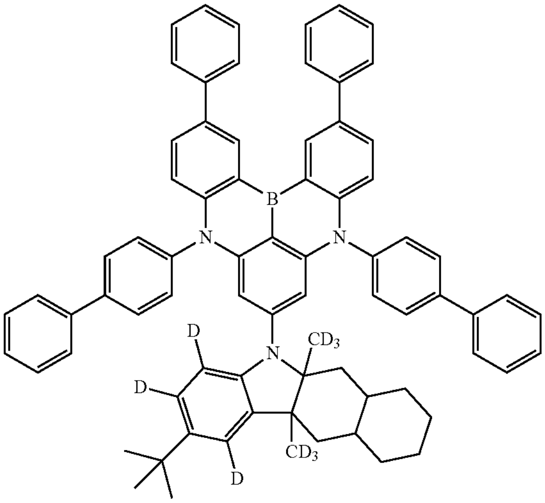
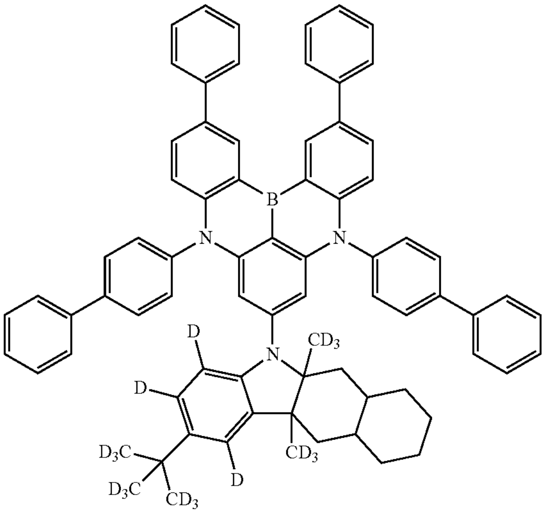

-continued
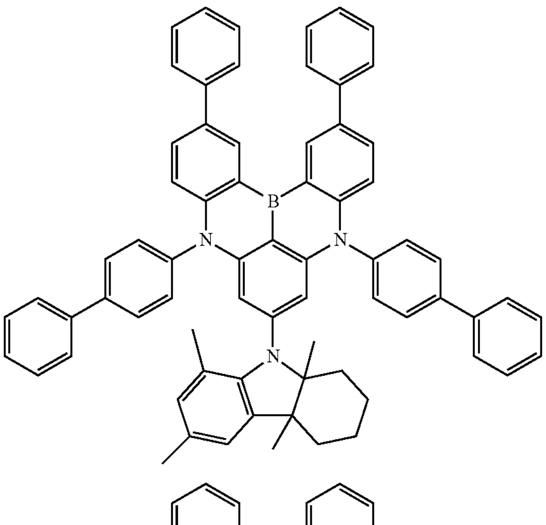
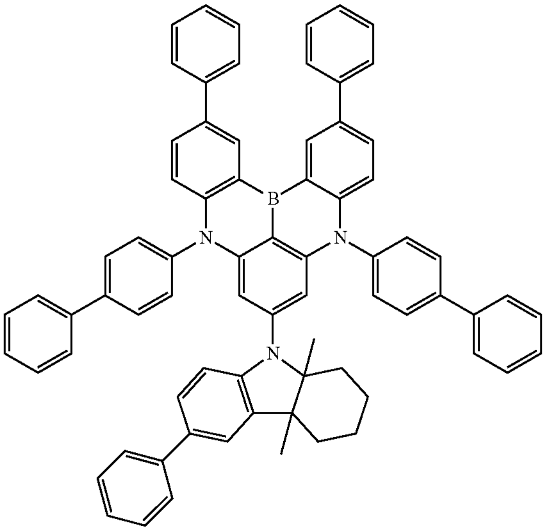
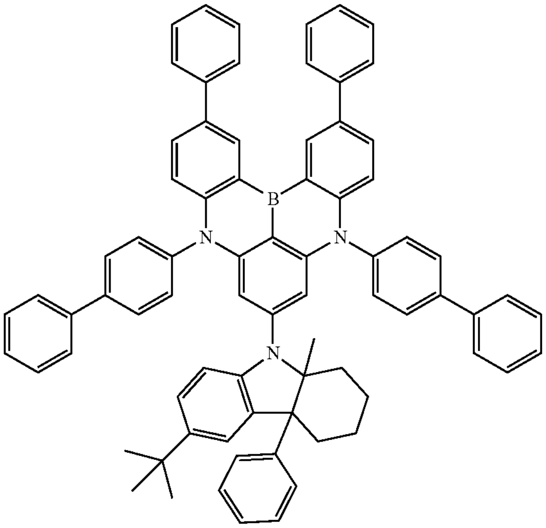
-continued
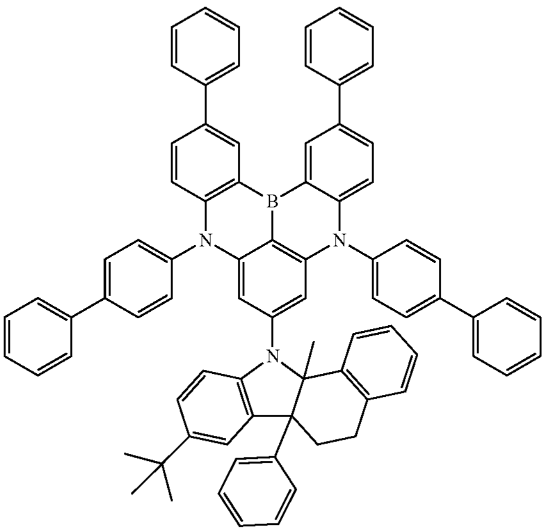
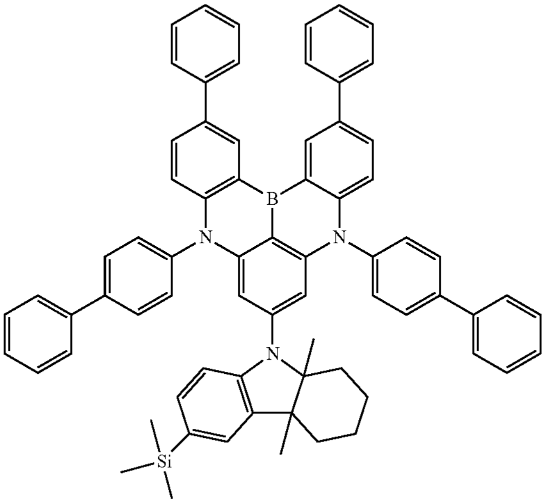
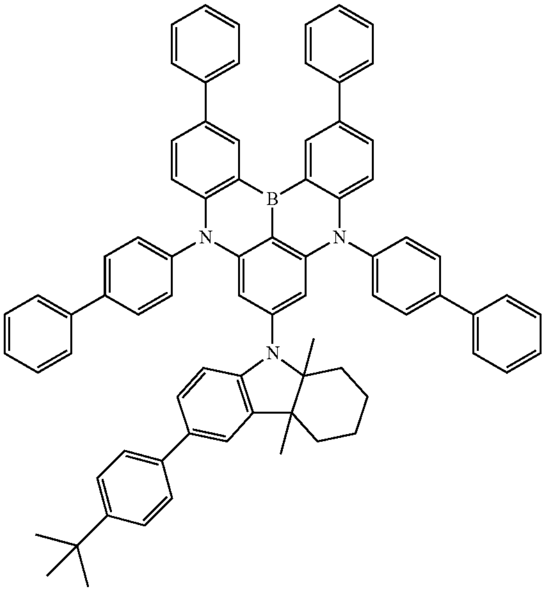

-continued
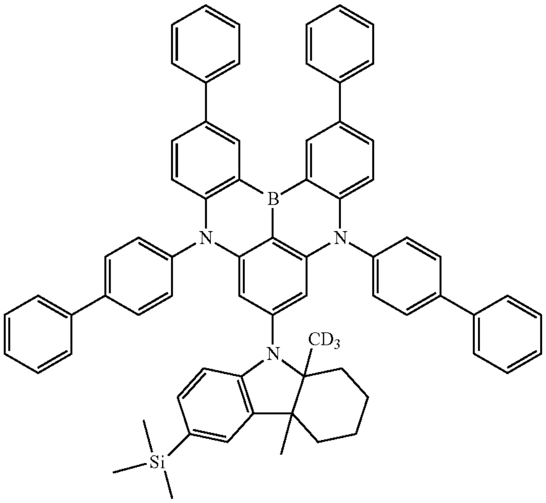
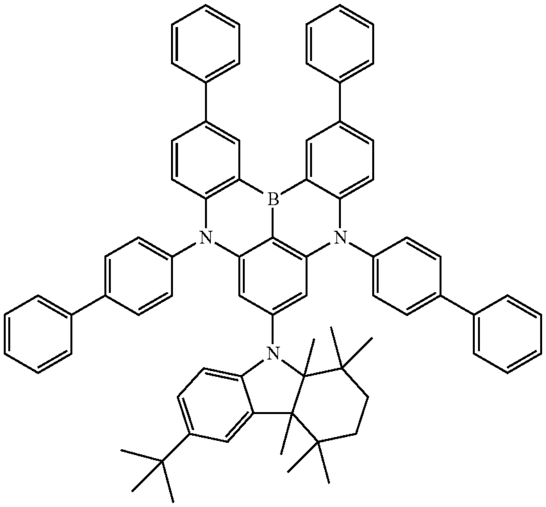
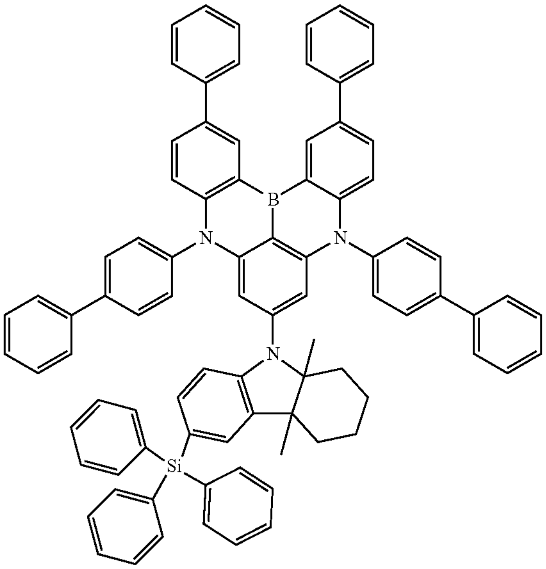
-continued
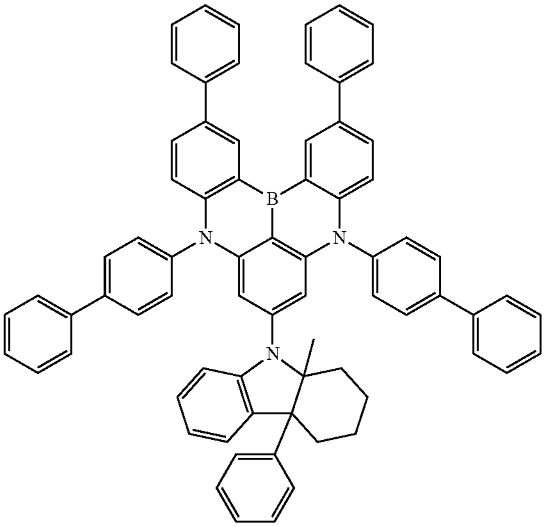
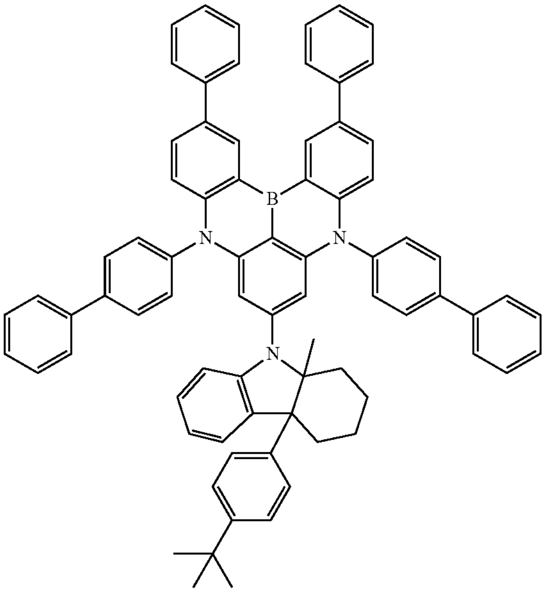
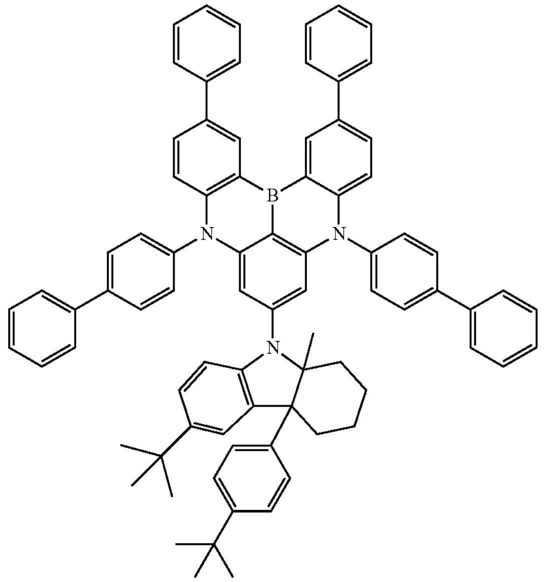

-continued
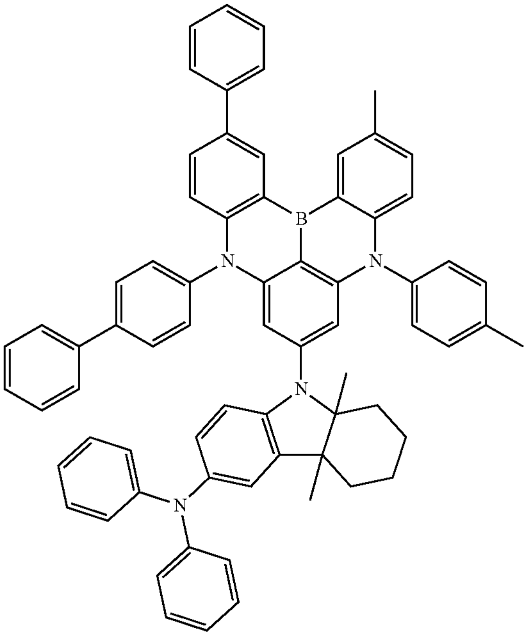
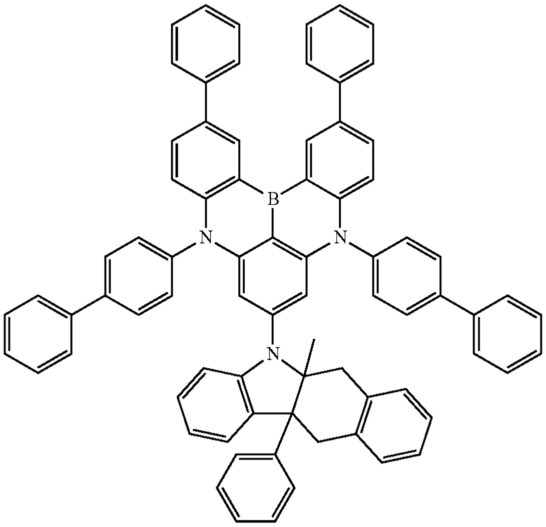
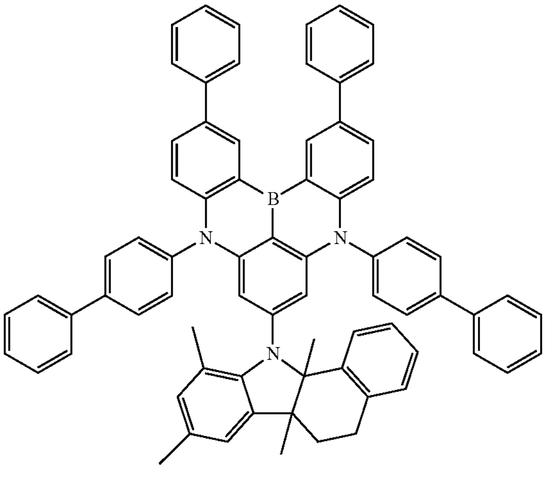
-continued
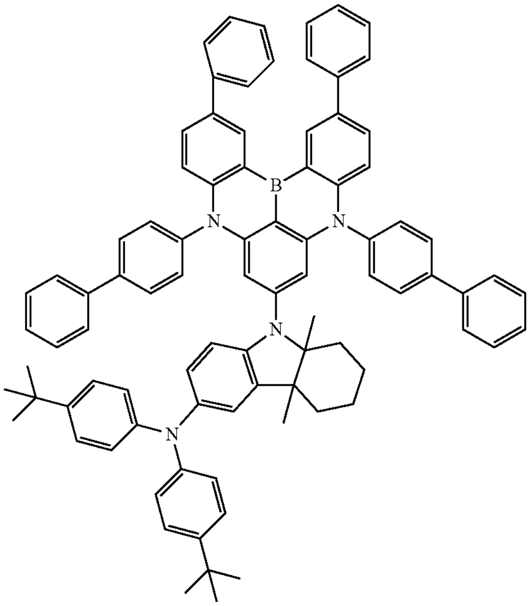
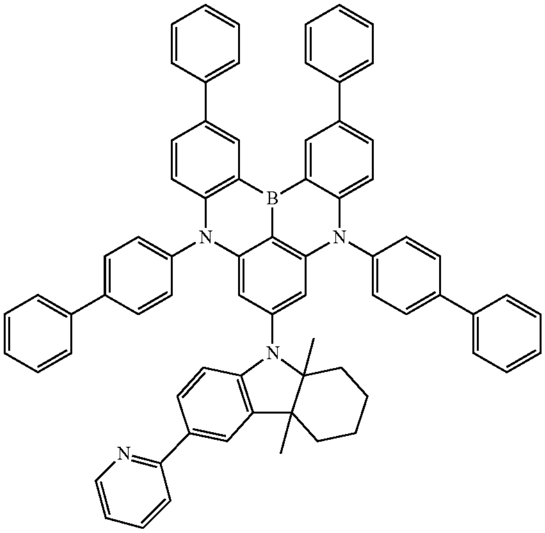
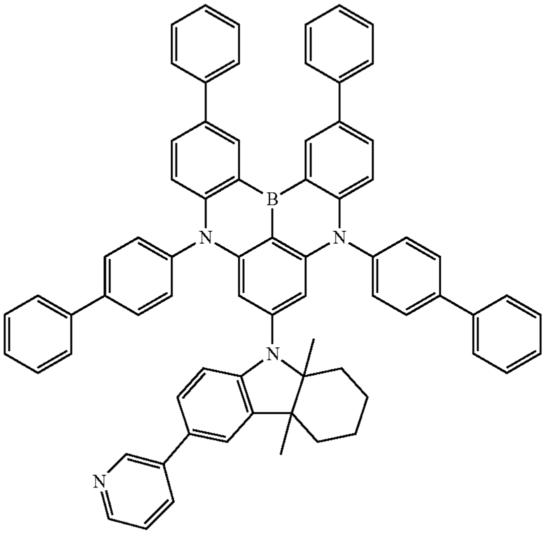

-continued
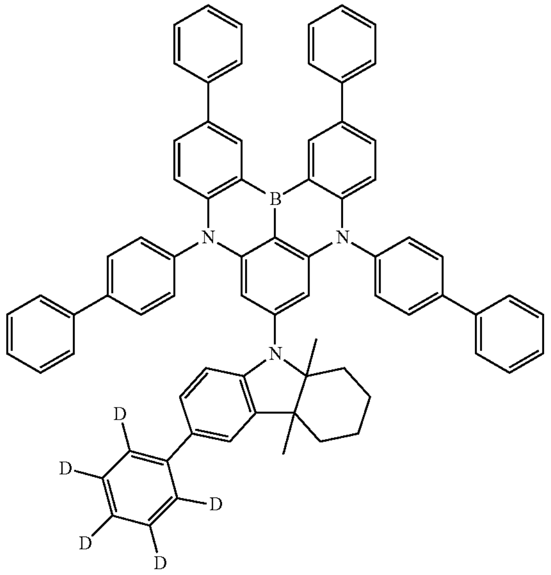
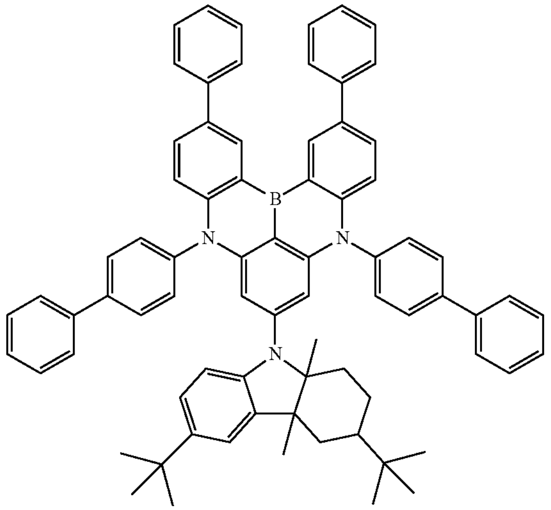
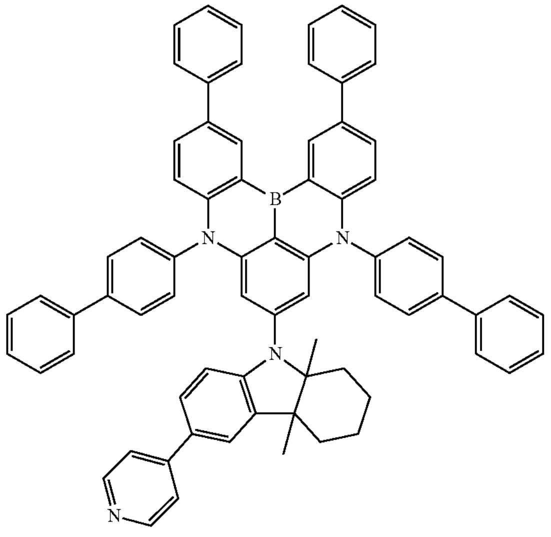
-continued
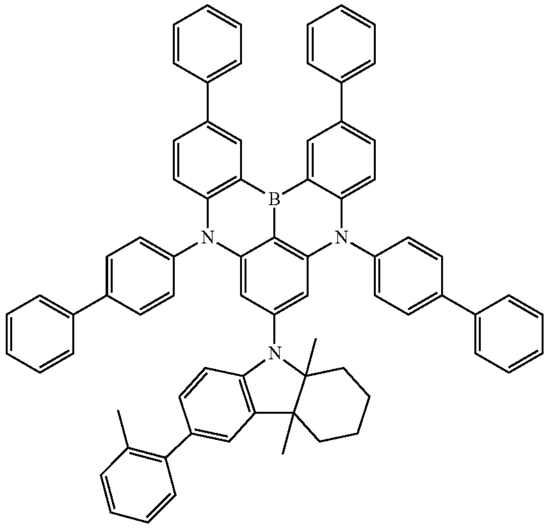
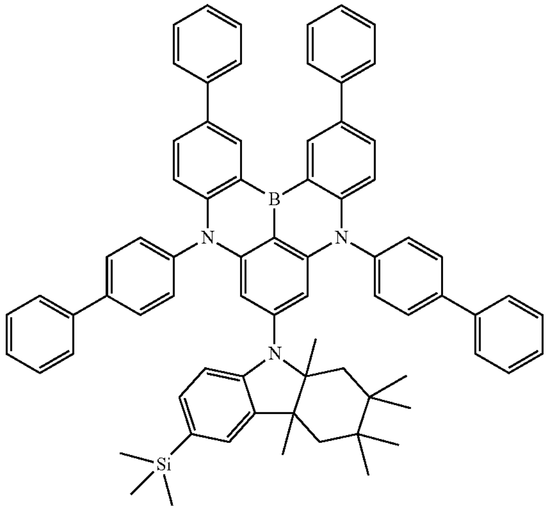
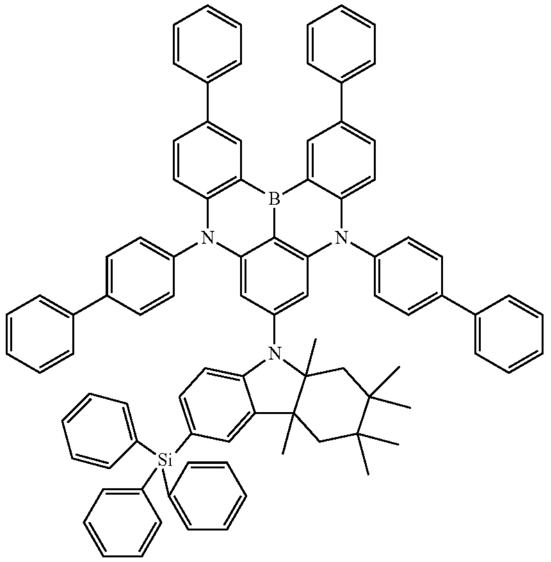

-continued
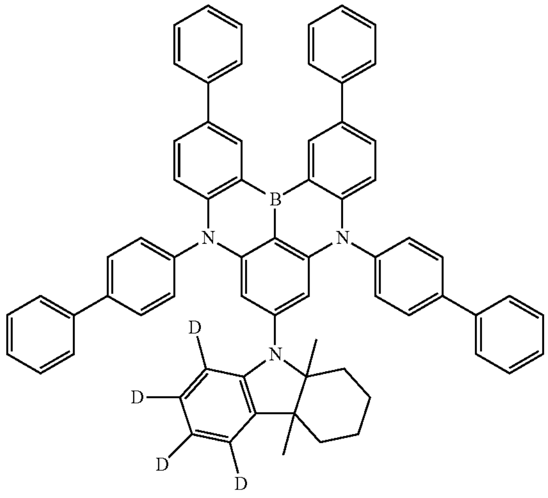
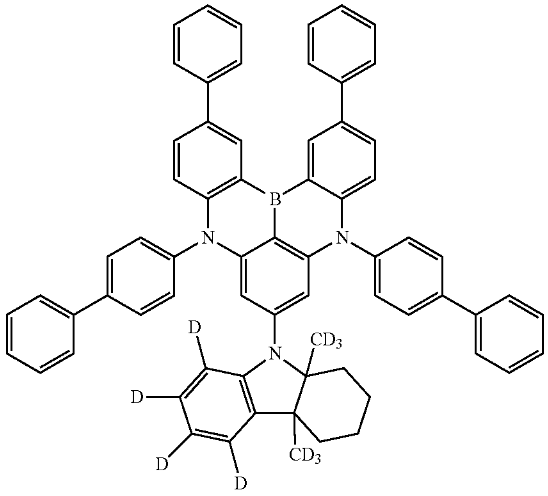
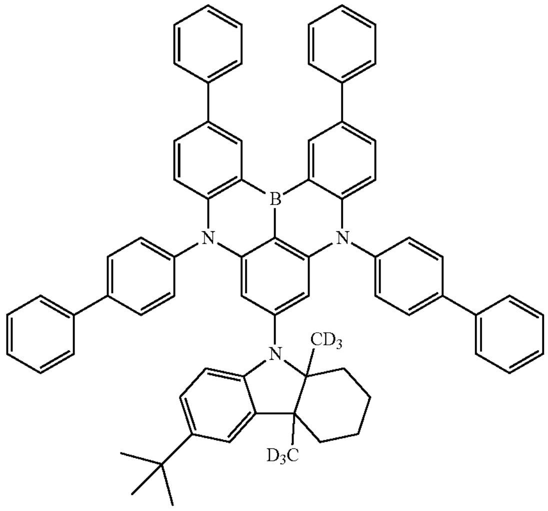
-continued
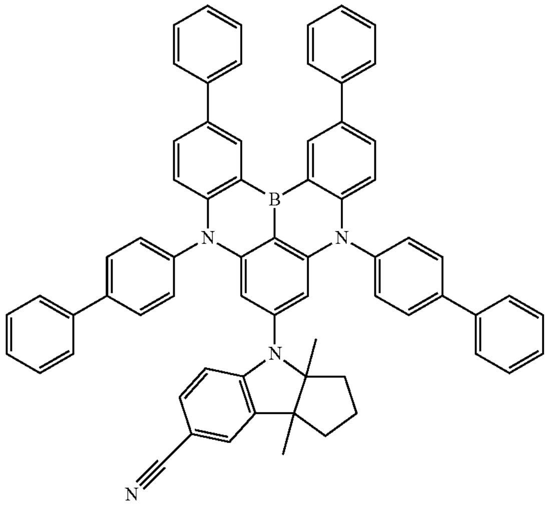
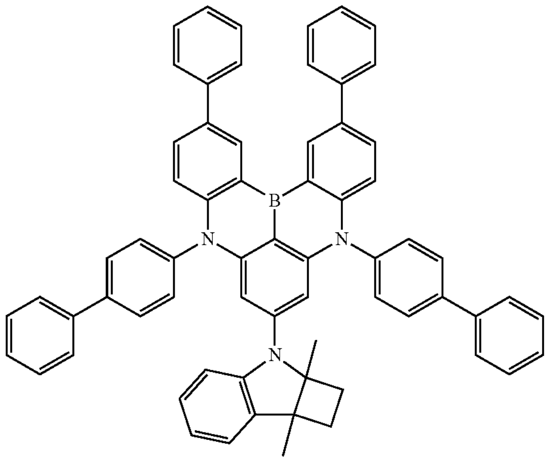
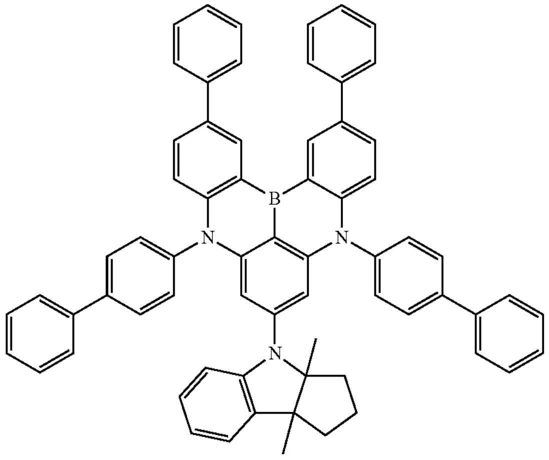

-continued
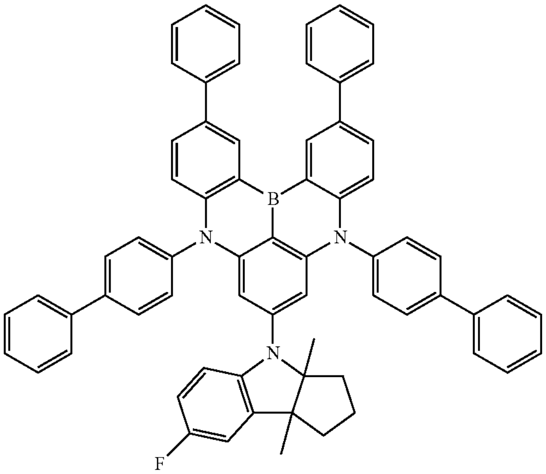
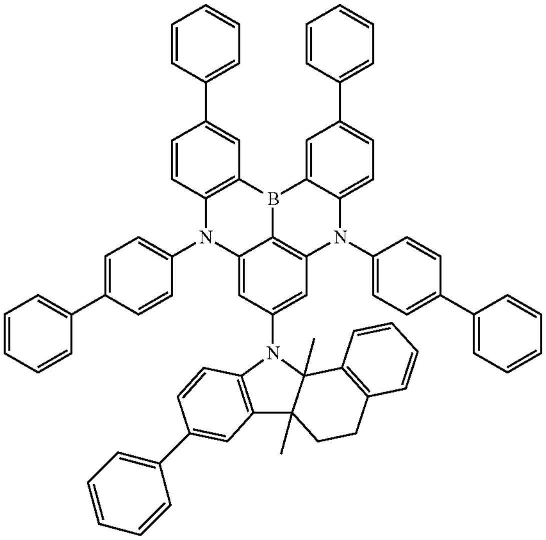
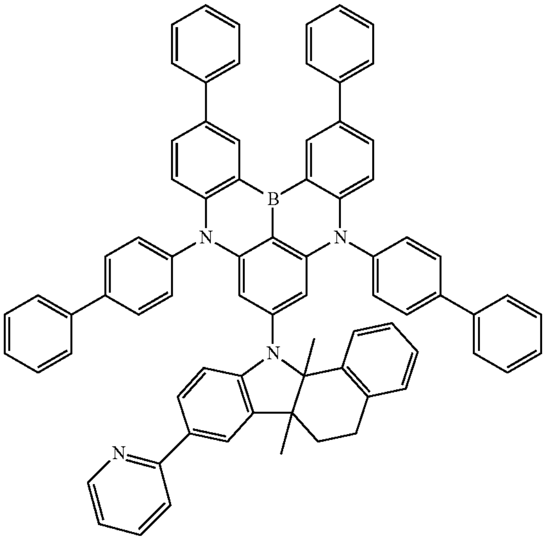
-continued
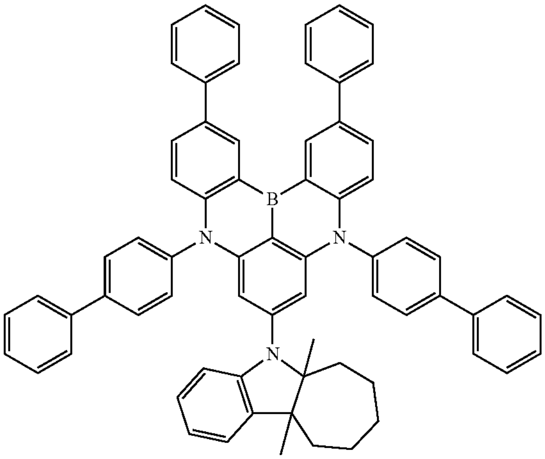
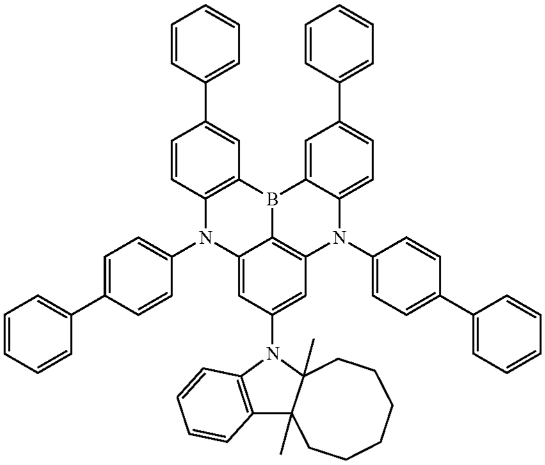
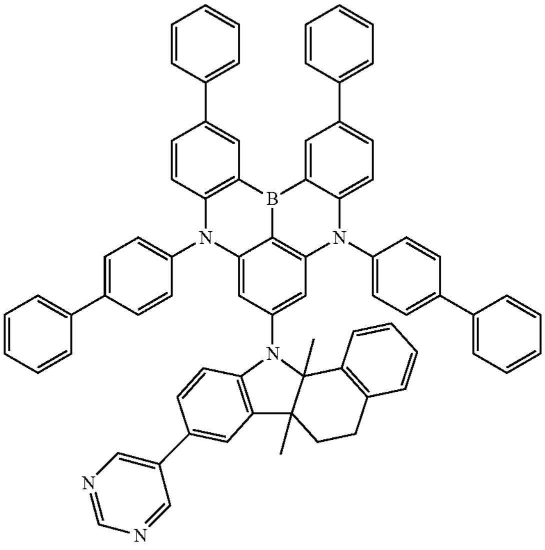

-continued
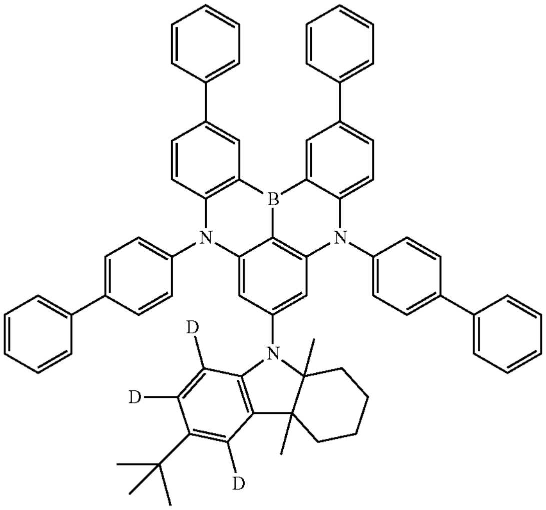
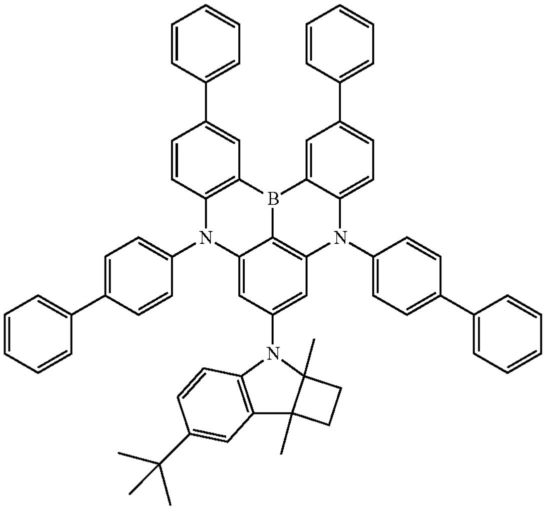
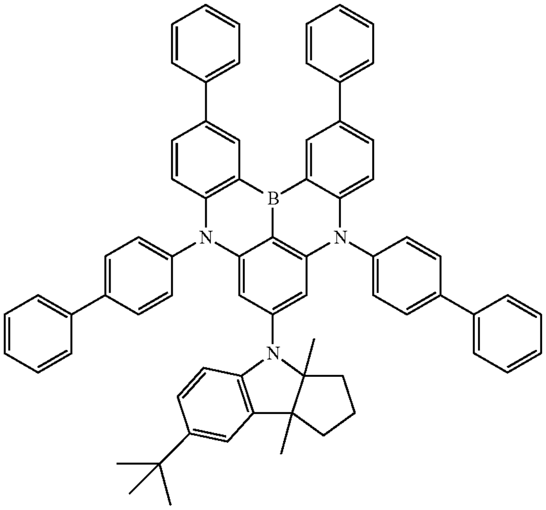
-continued
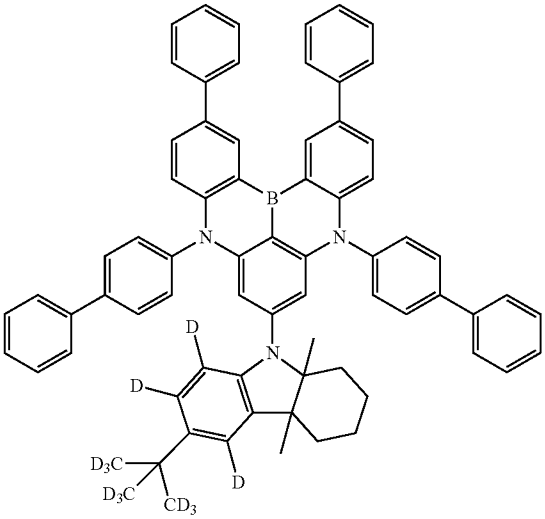
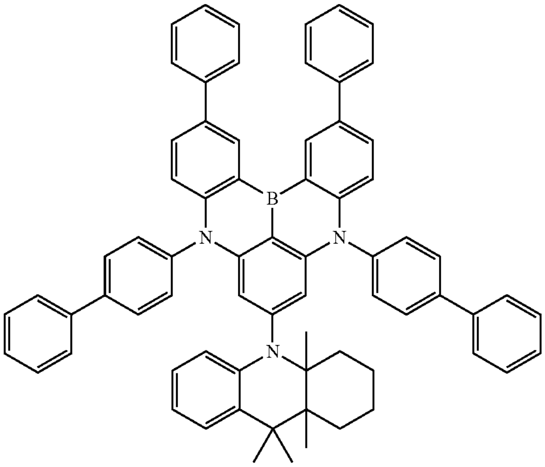
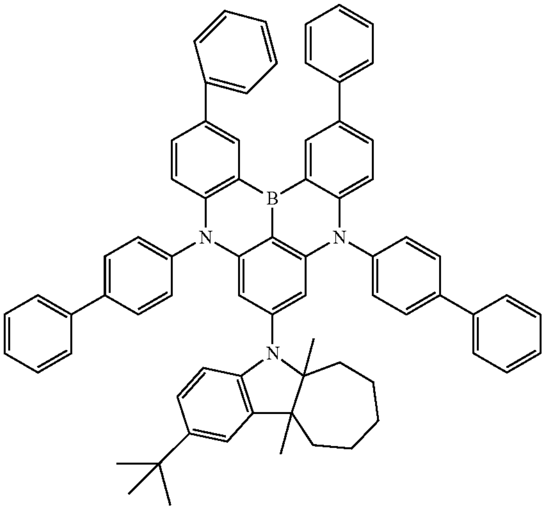

-continued
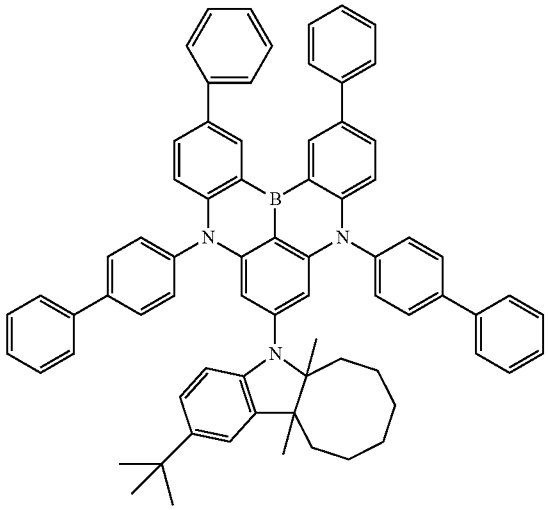
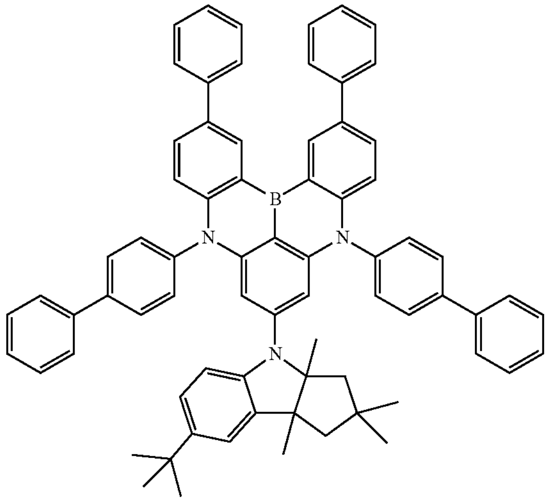
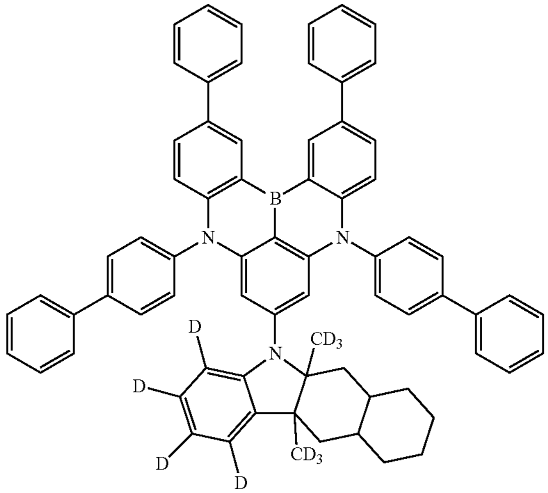
-continued
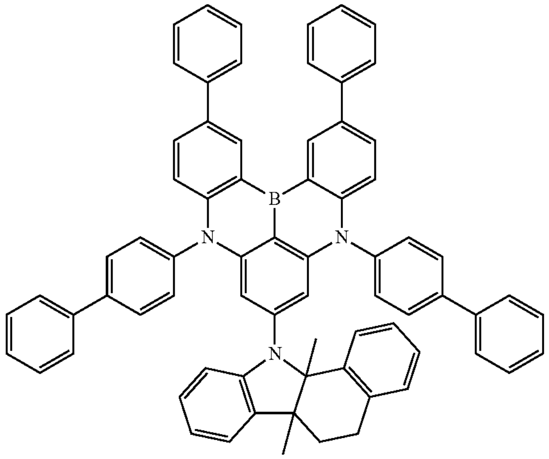
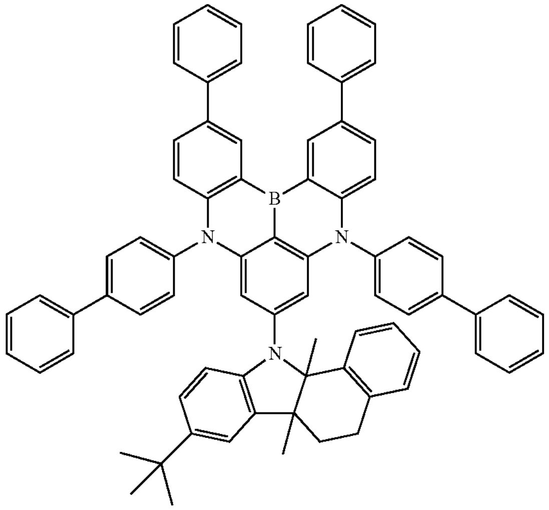
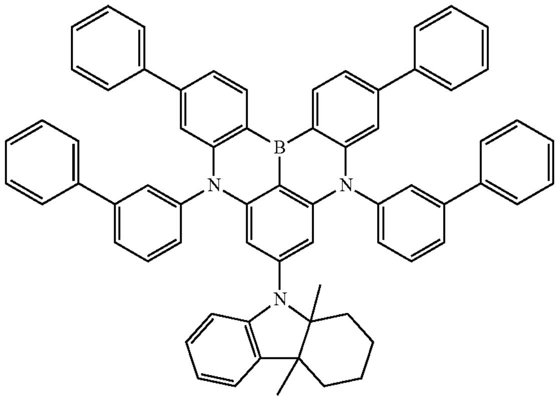

-continued
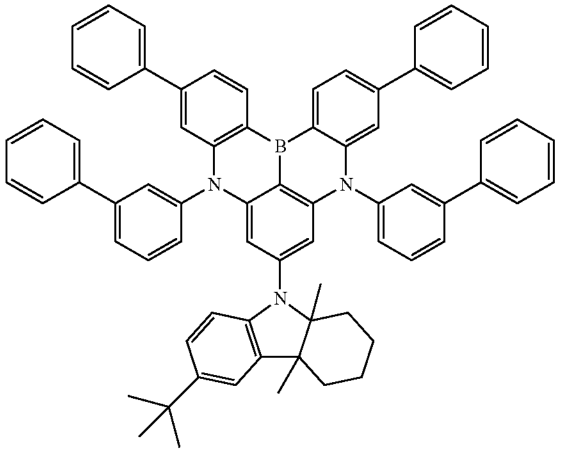
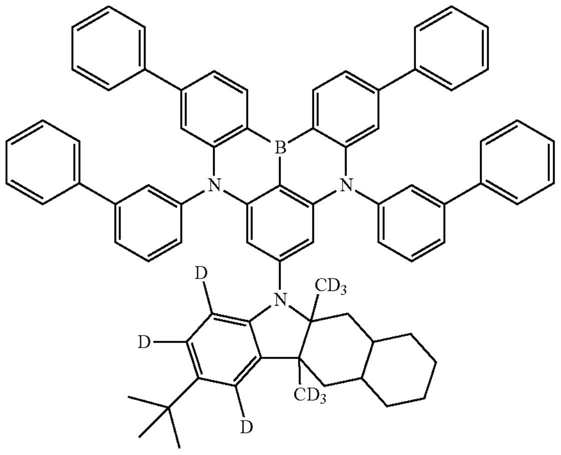
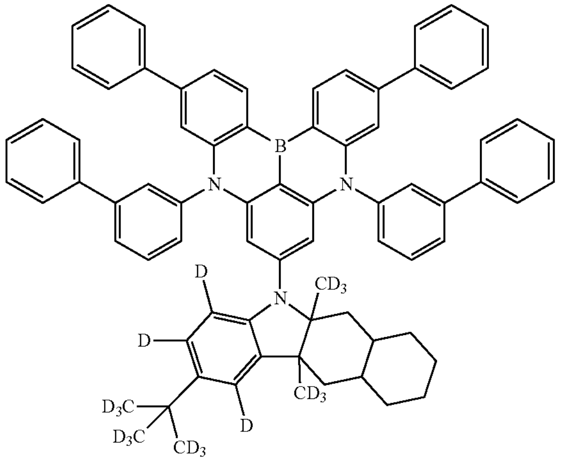
-continued
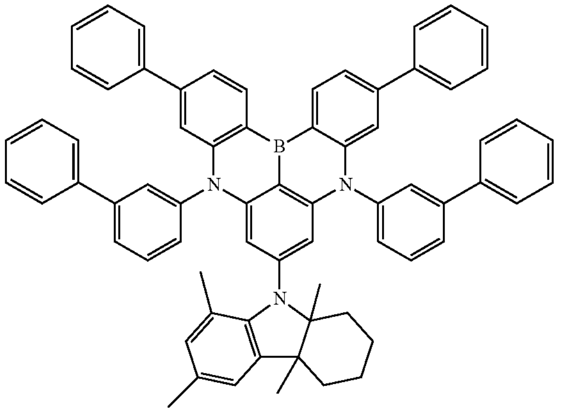
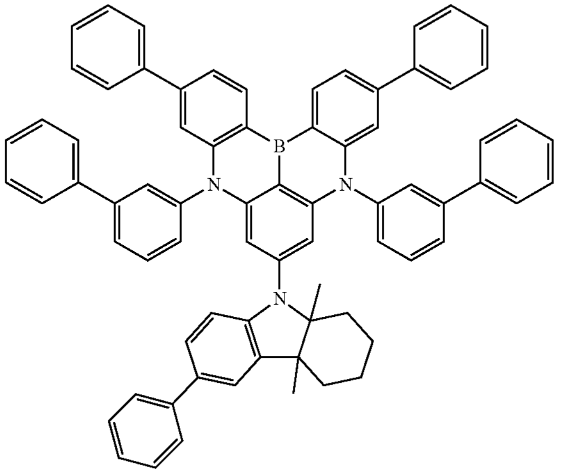
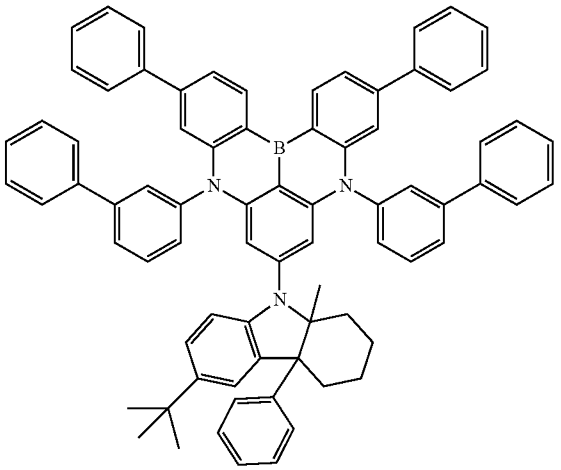

-continued
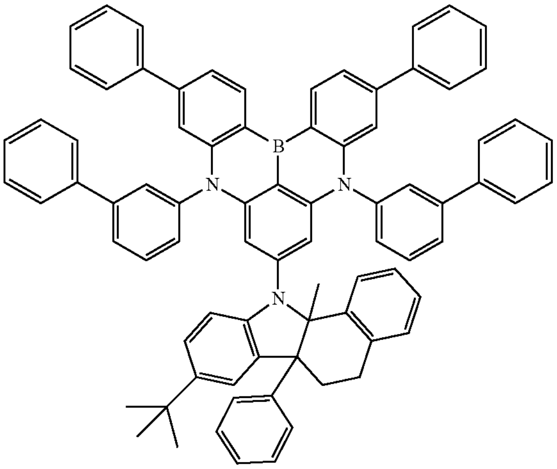
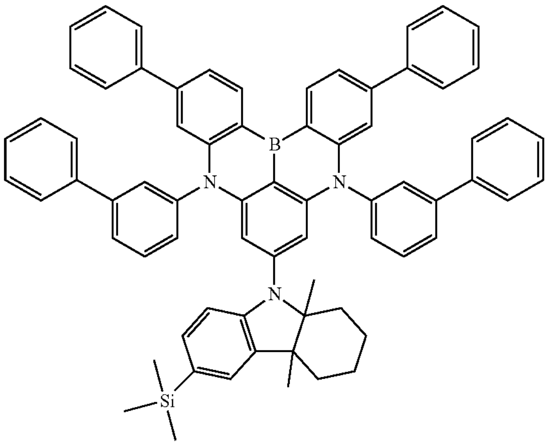
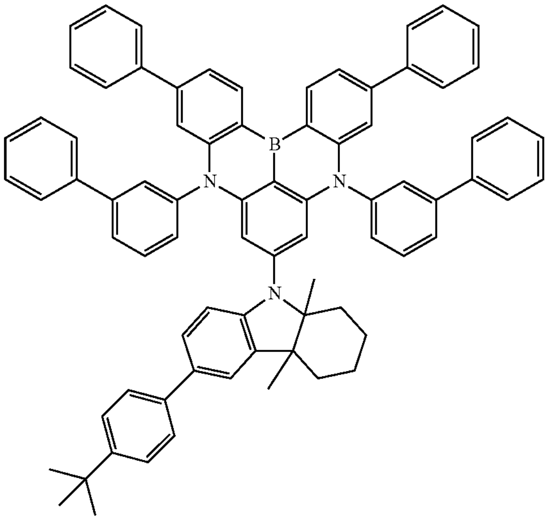
-continued
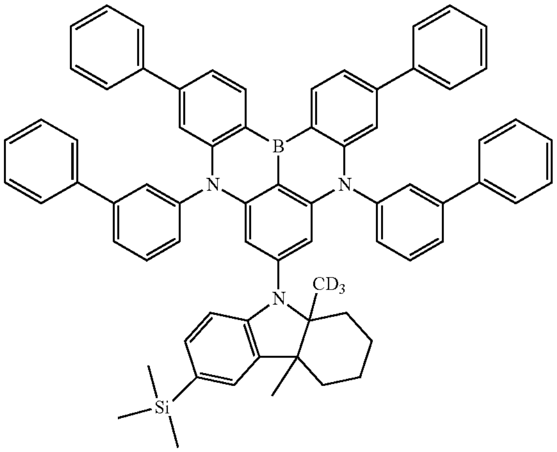
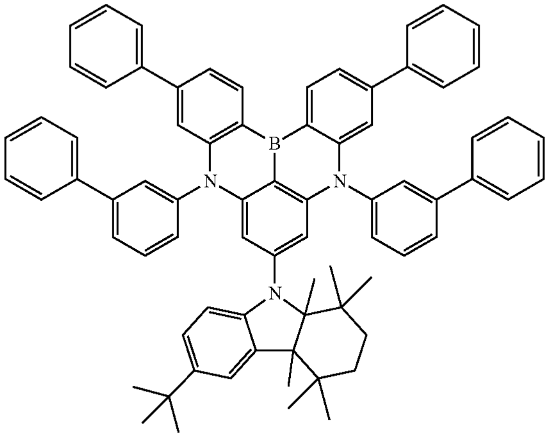
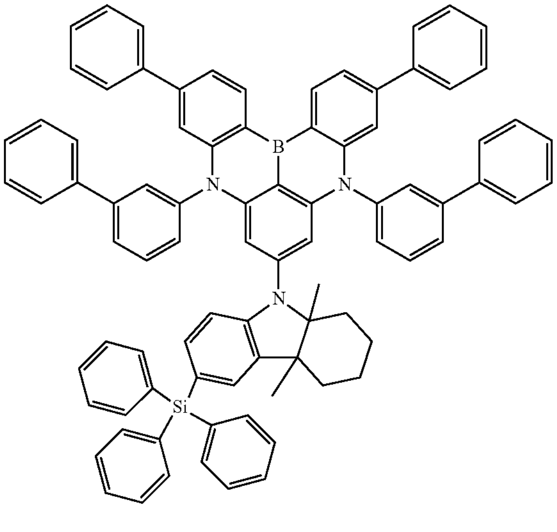

-continued
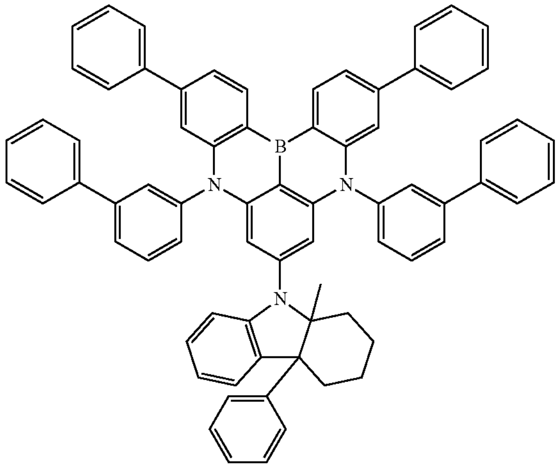
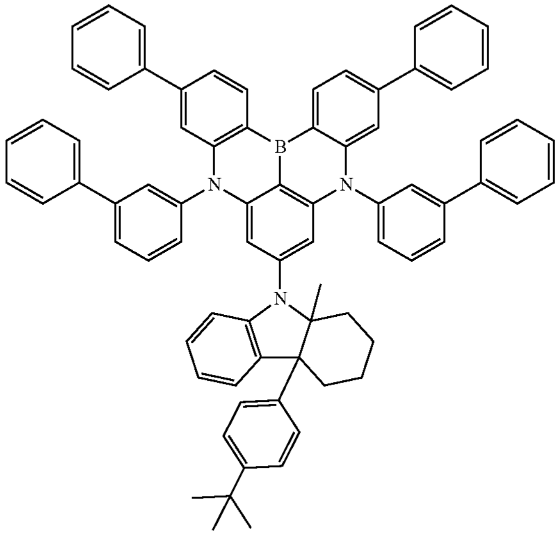
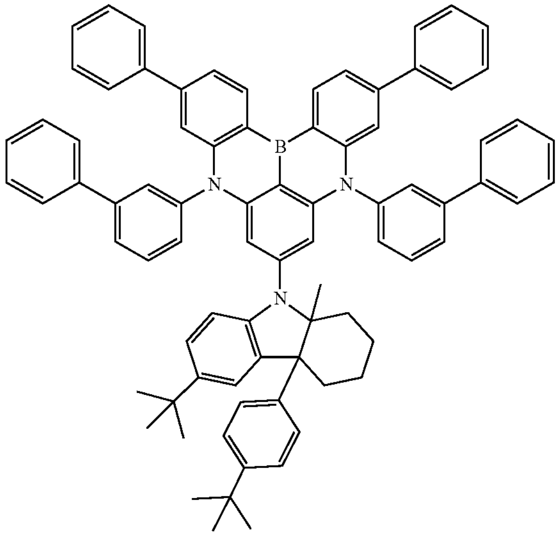
-continued
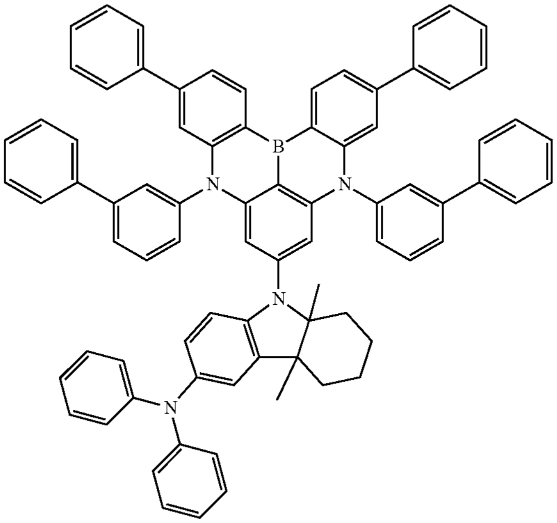
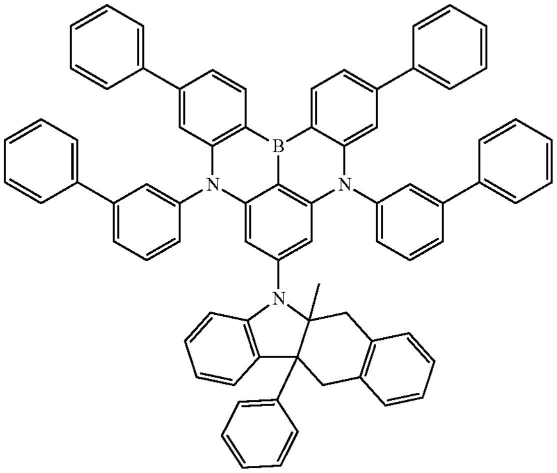
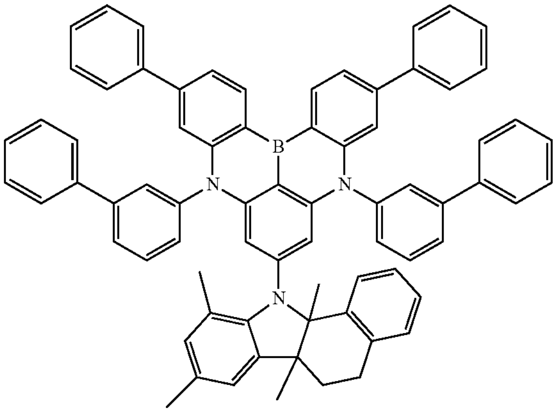

-continued
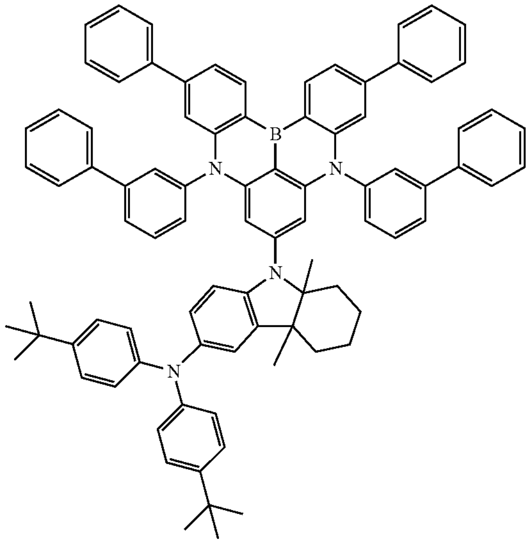
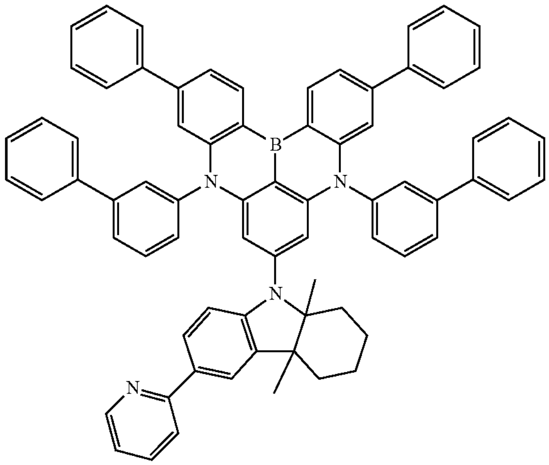
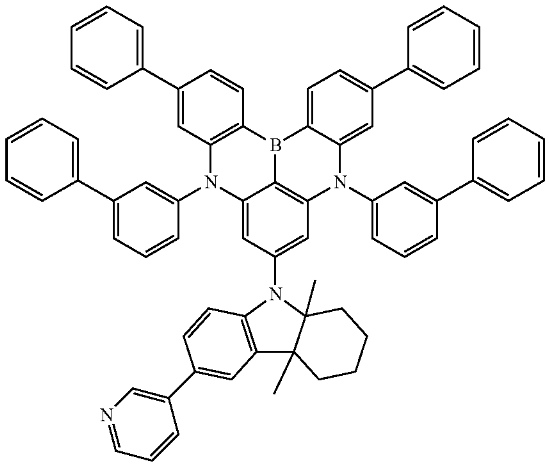
-continued
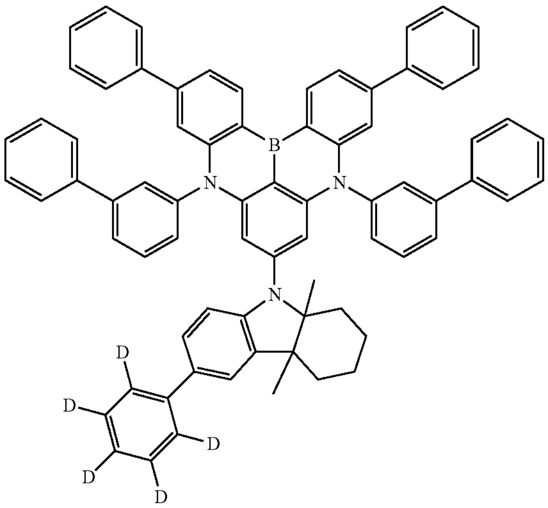
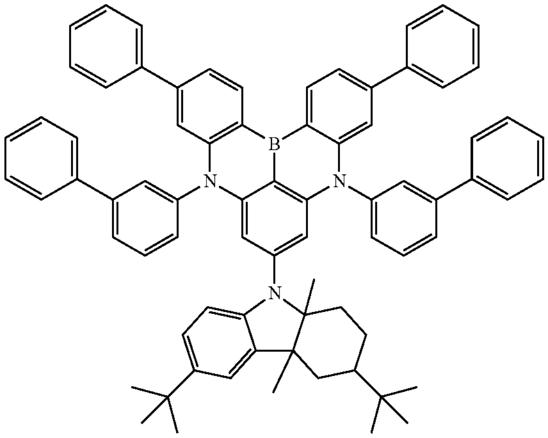
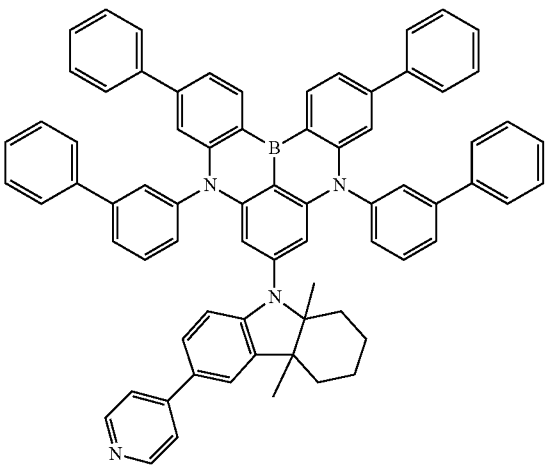

-continued
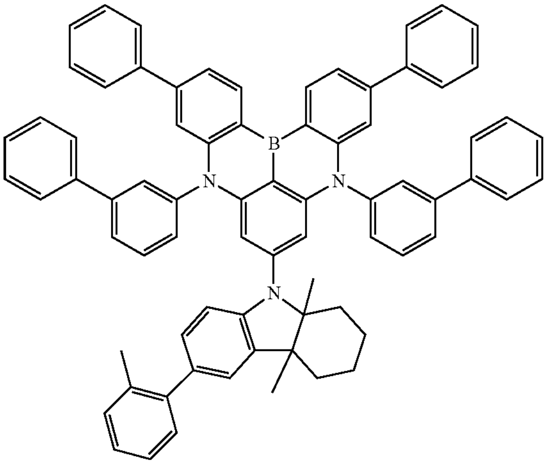
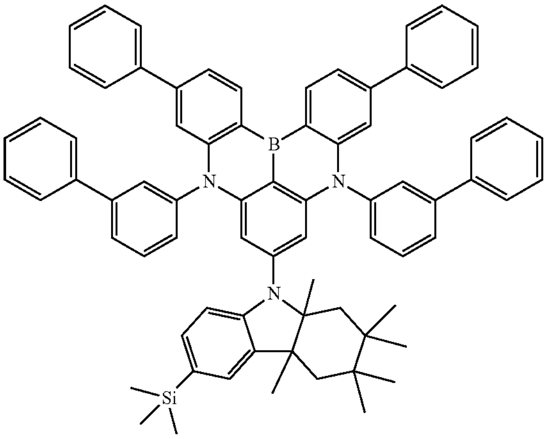
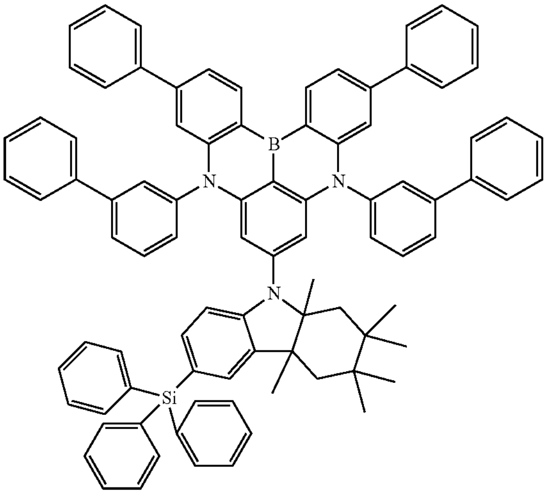
-continued
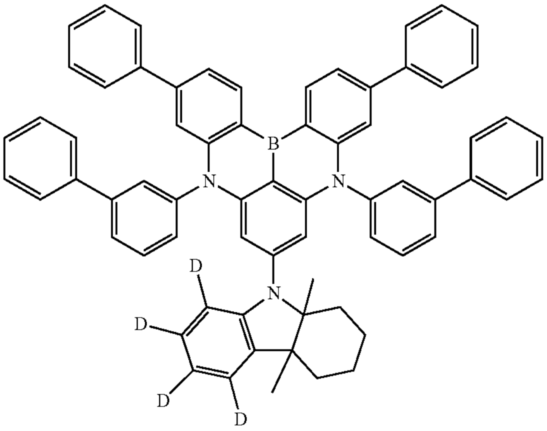
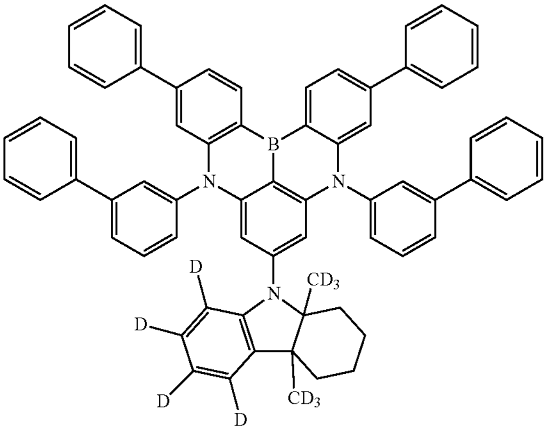
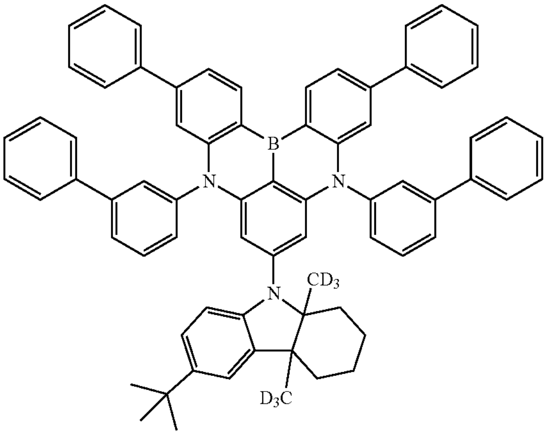

-continued
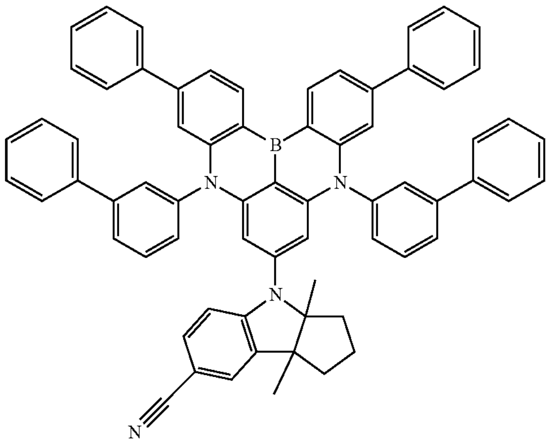
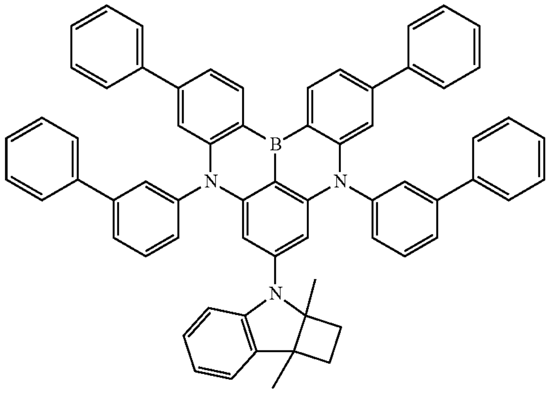
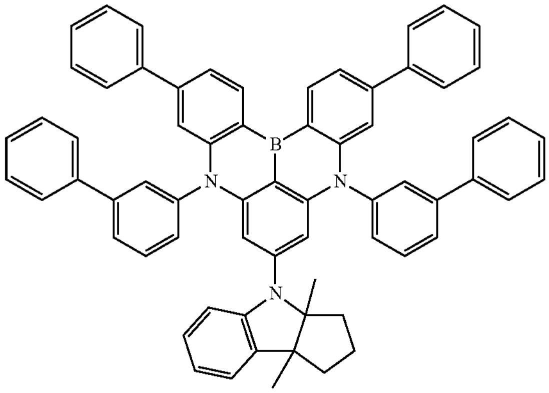
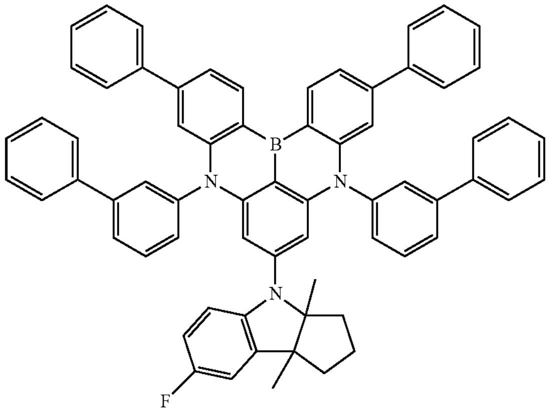
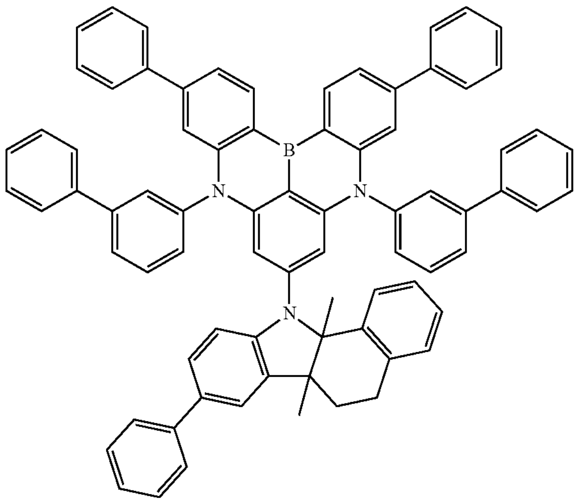
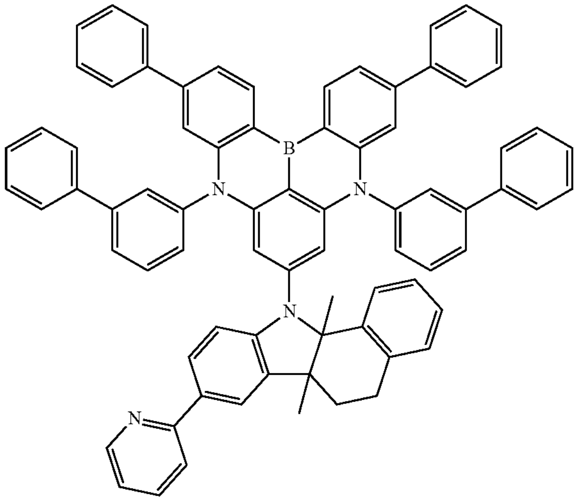
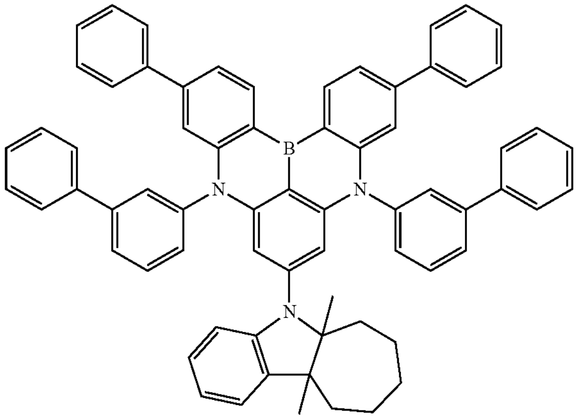

-continued
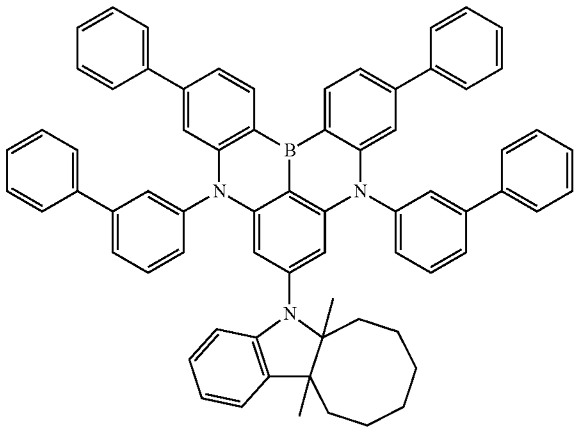
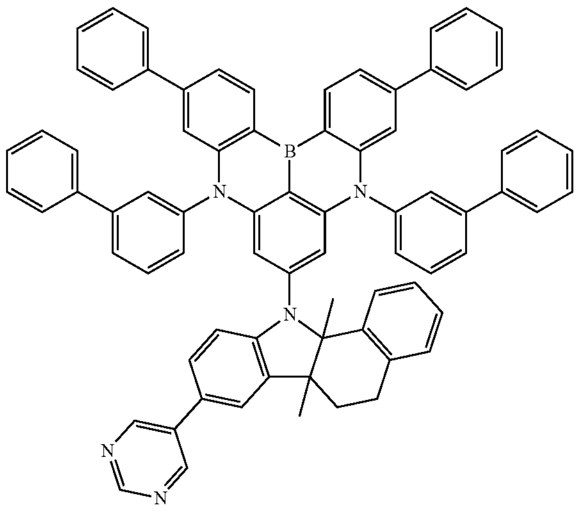
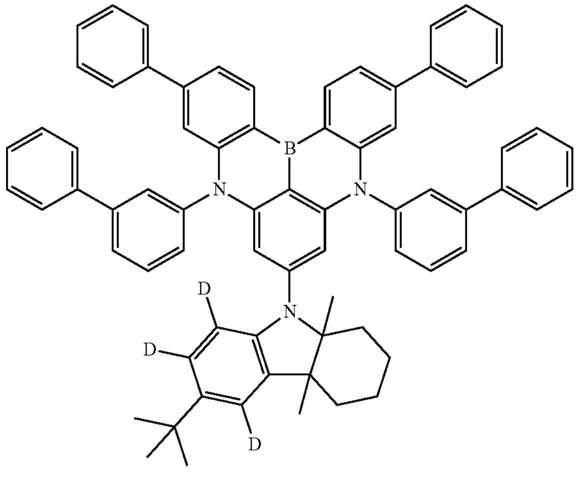
-continued
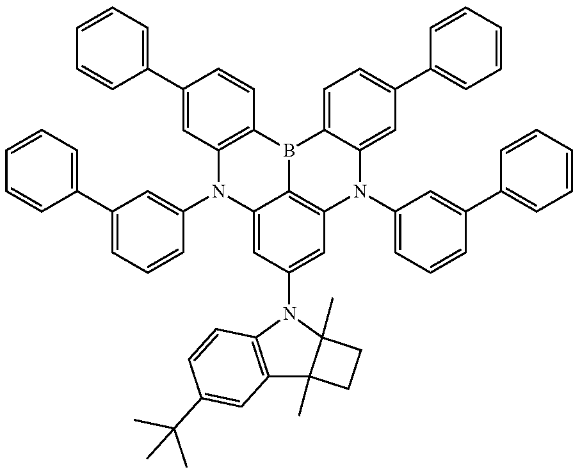
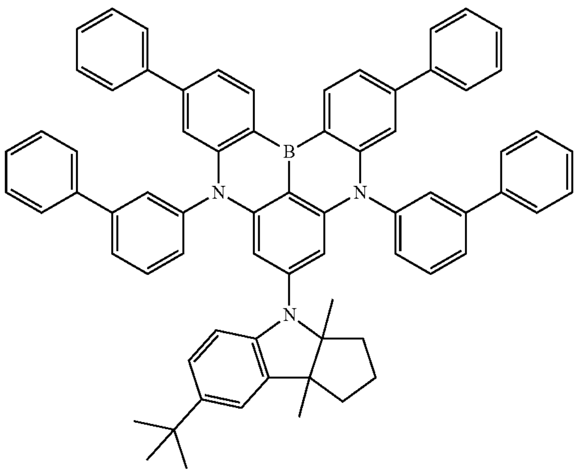
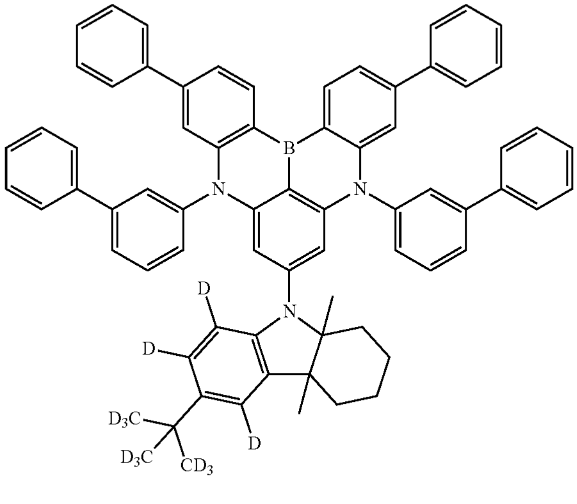

-continued
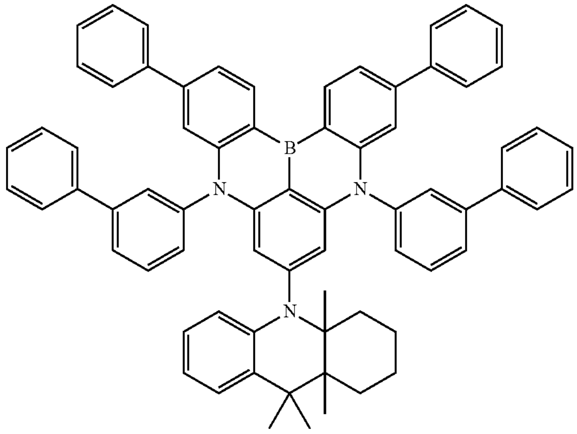
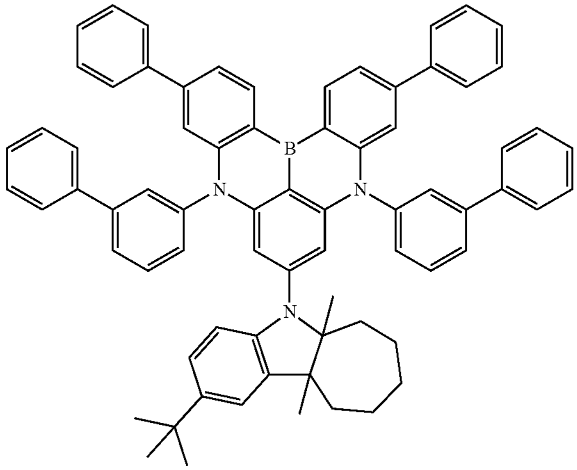
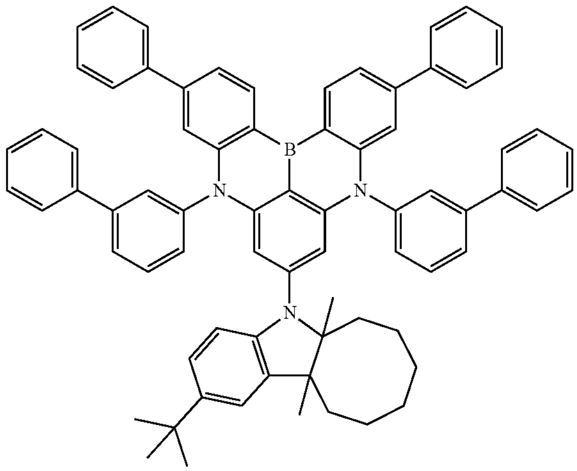
-continued
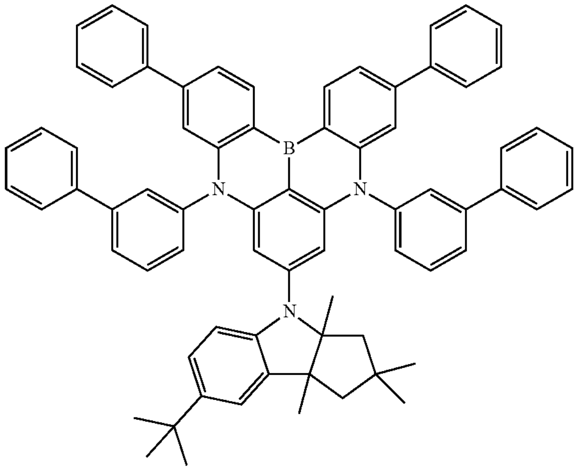
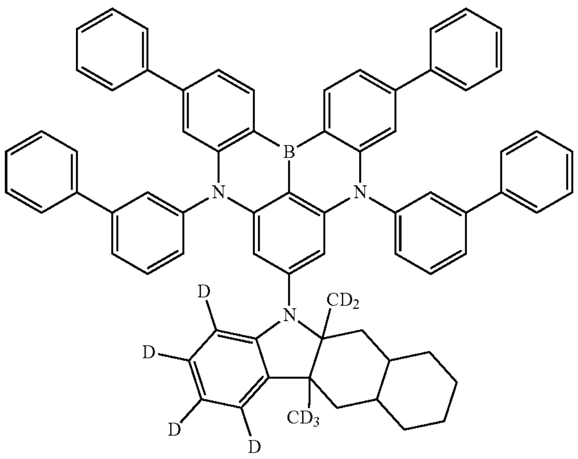
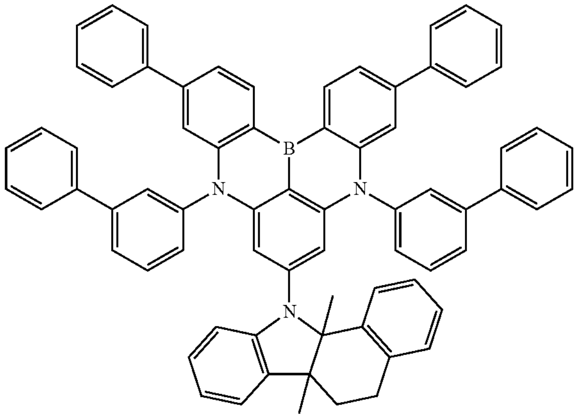

-continued
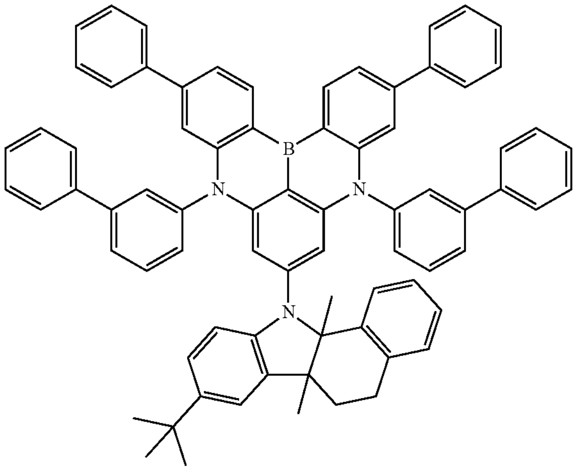
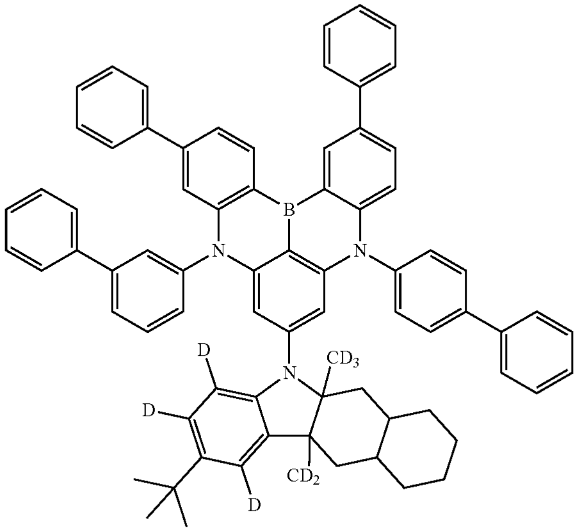
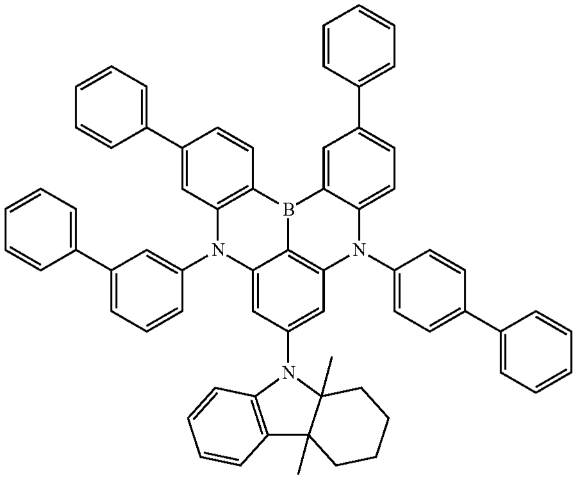
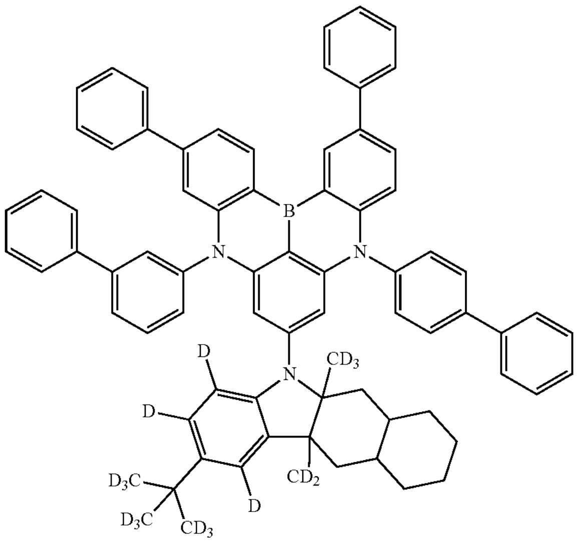
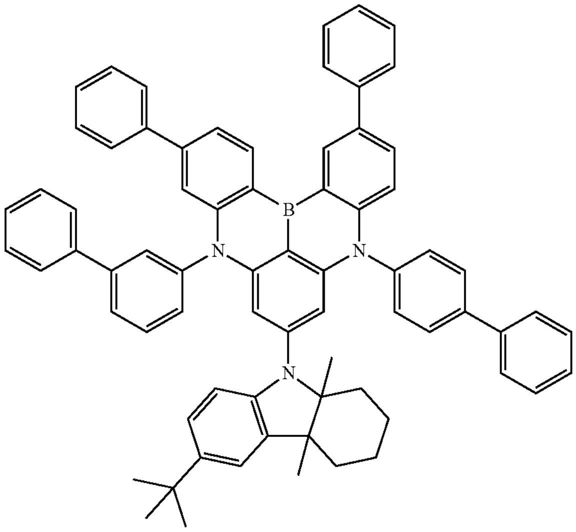
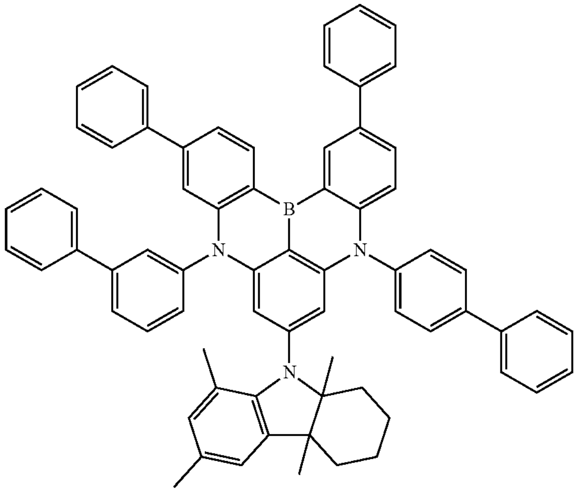
-continued -continued
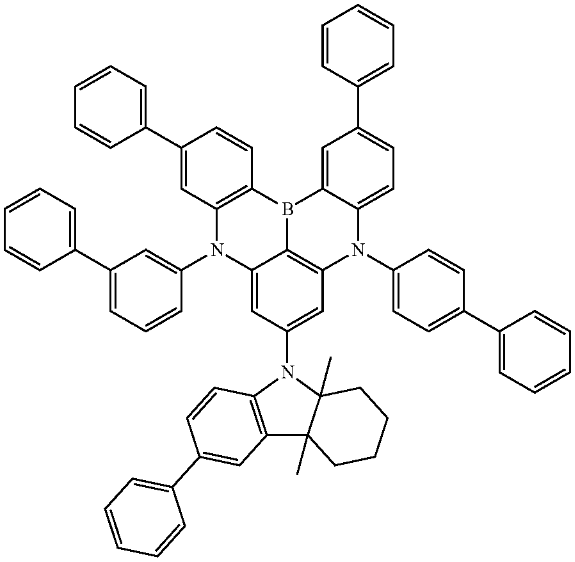
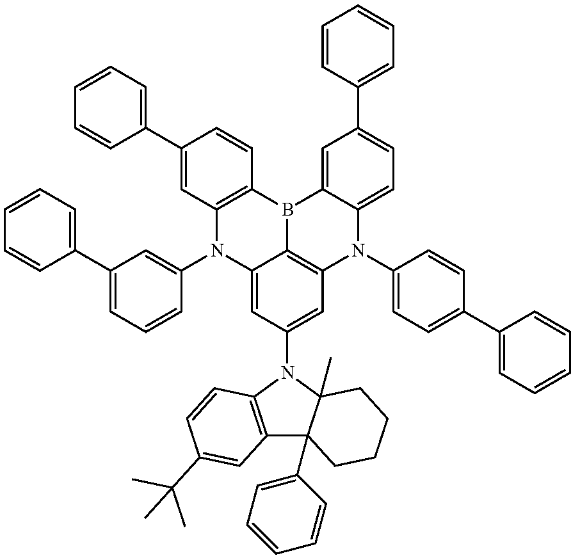
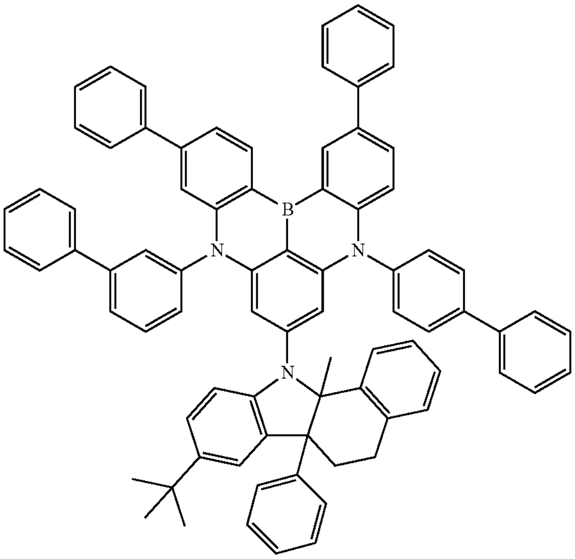
-continued
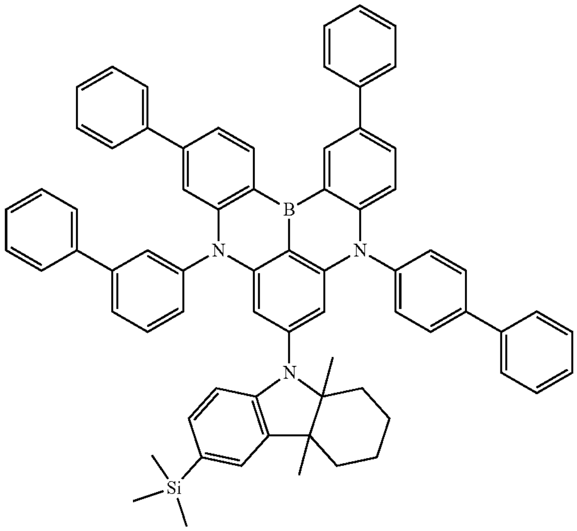
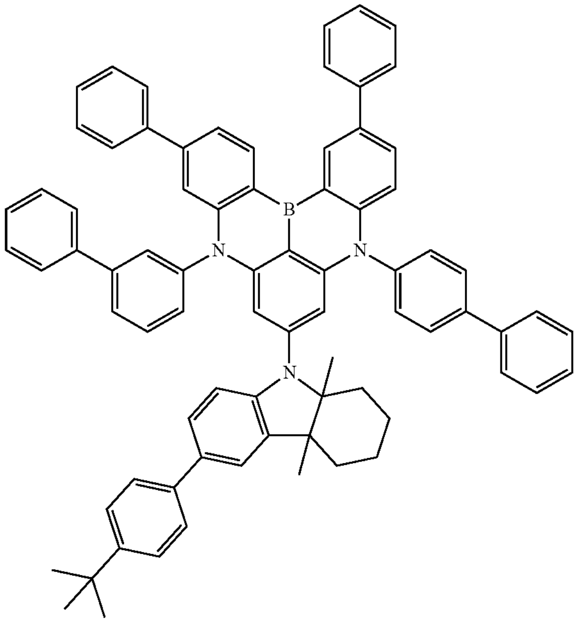
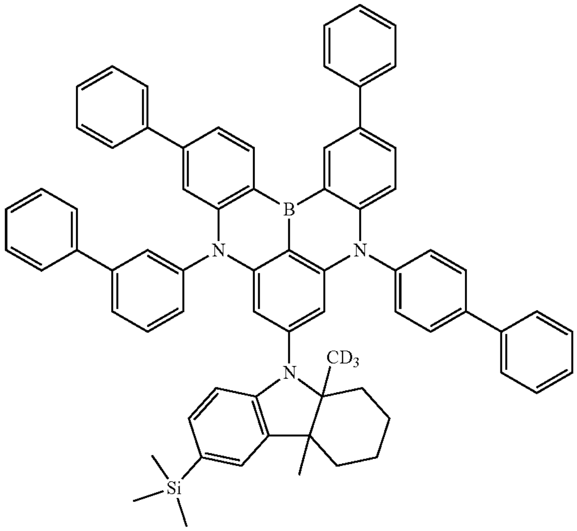

-continued
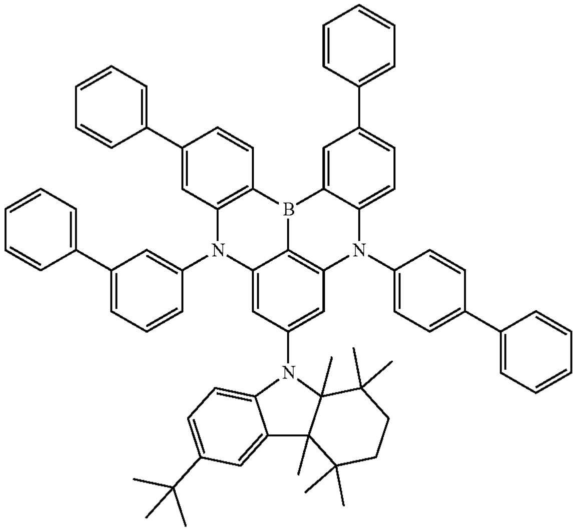
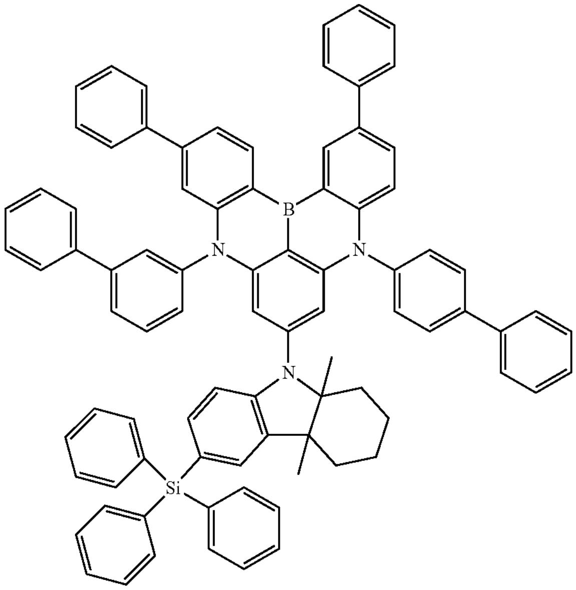
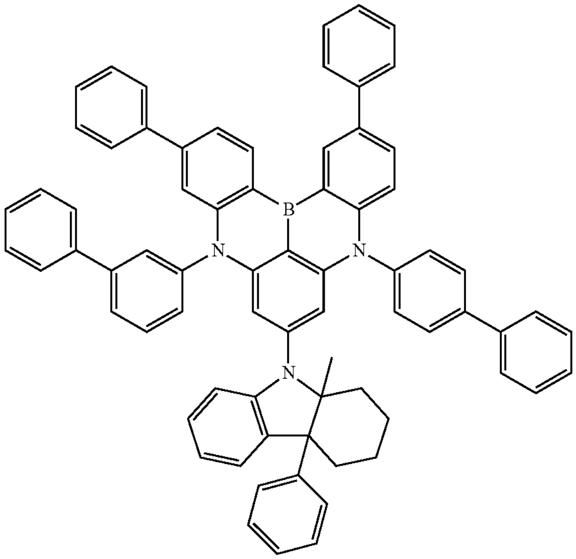
-continued
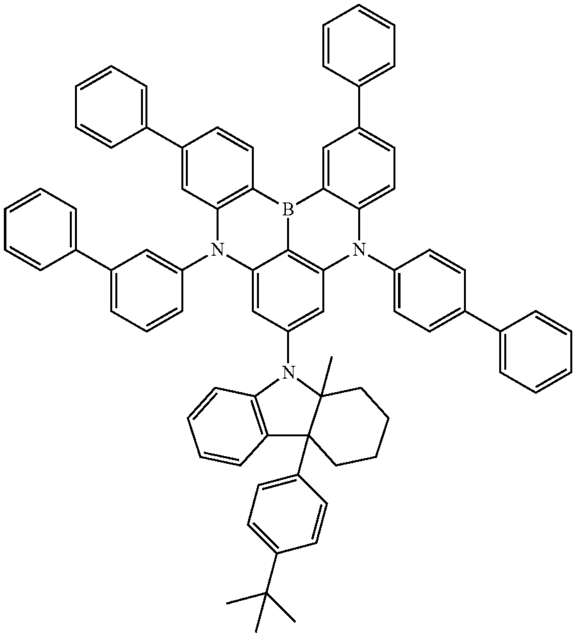
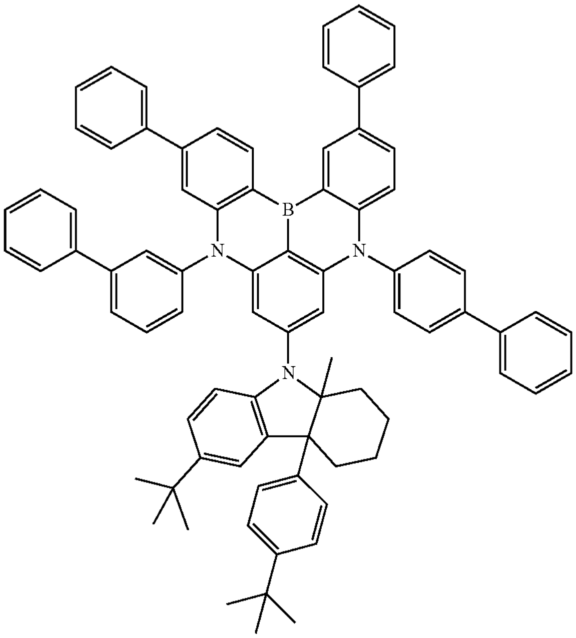 [SMILES: CC(C)(C)c1ccc(C23CCCCC2(C)N(c2cc4c5c(c2)N(c2cccc(-c6ccccc6)c2)c2cc(-c6ccccc6)ccc2B5c2cc(-c5ccccc5)ccc2N4c2ccc(-c4ccccc4)cc2)c2ccc(C(C)(C)C)cc23)cc1]

-continued
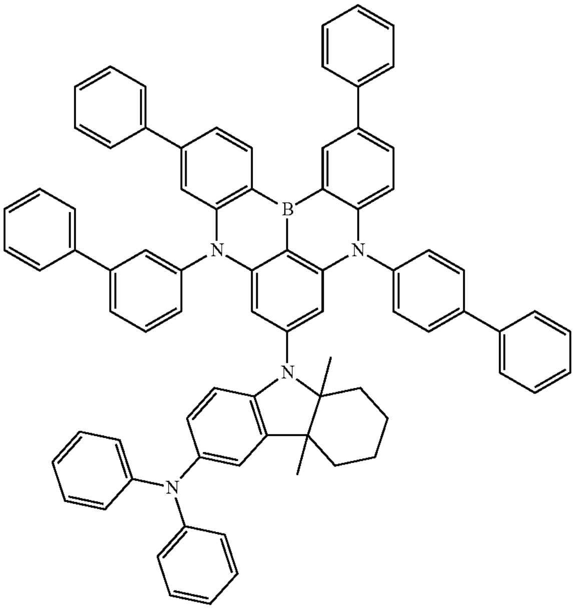
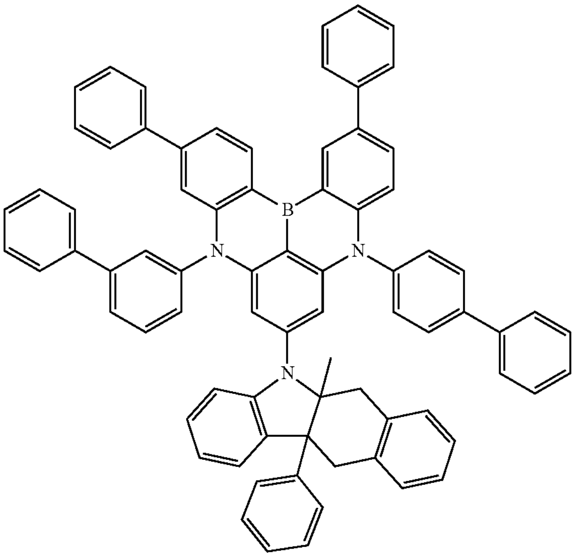
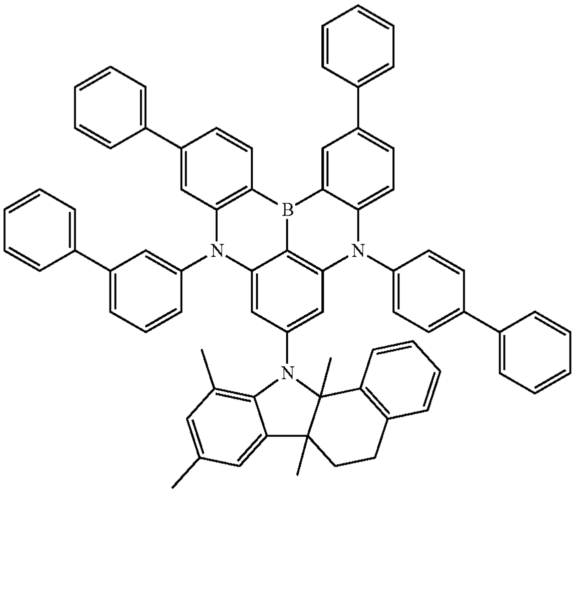
-continued
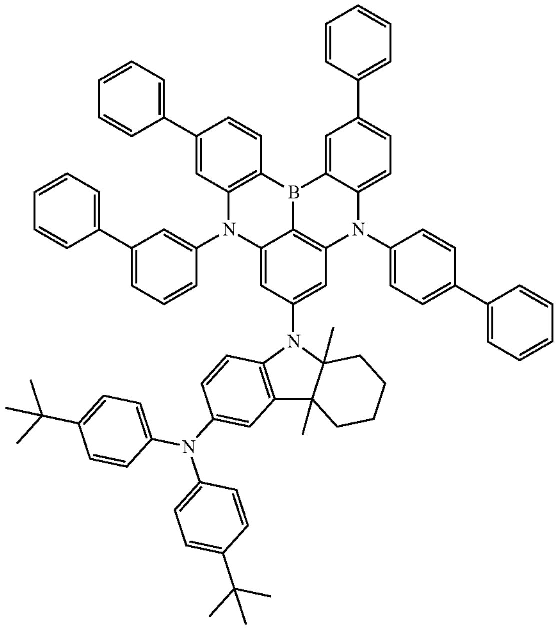
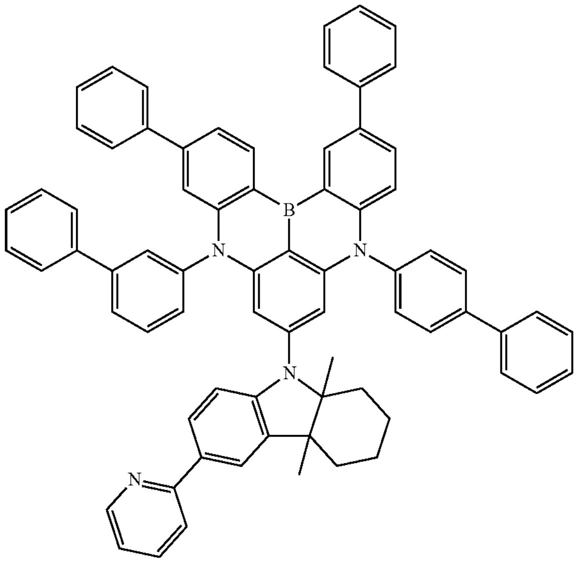

-continued
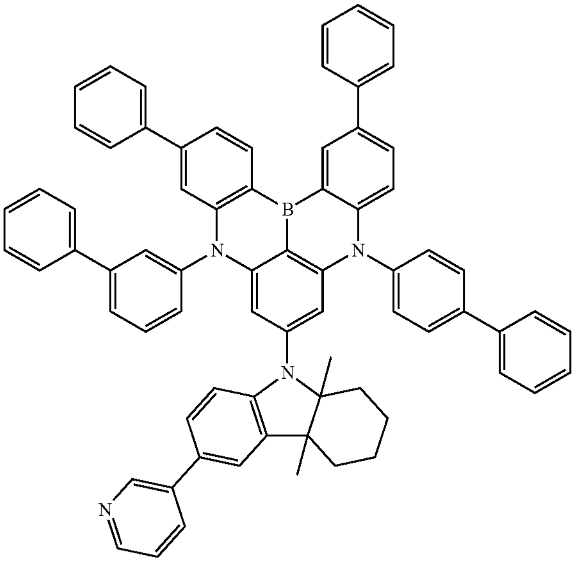
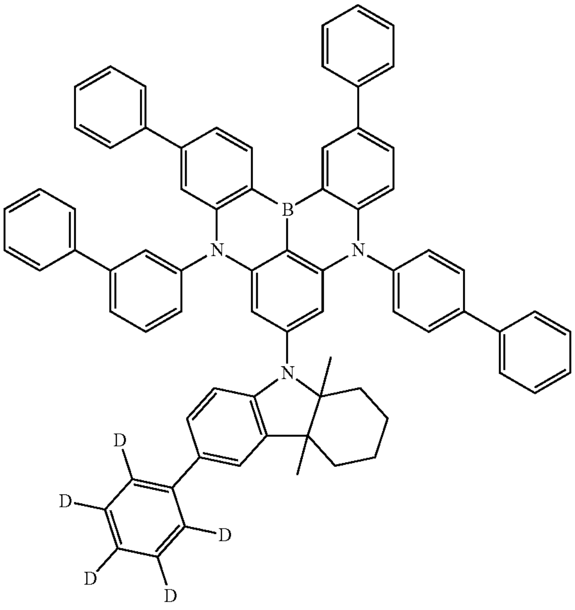
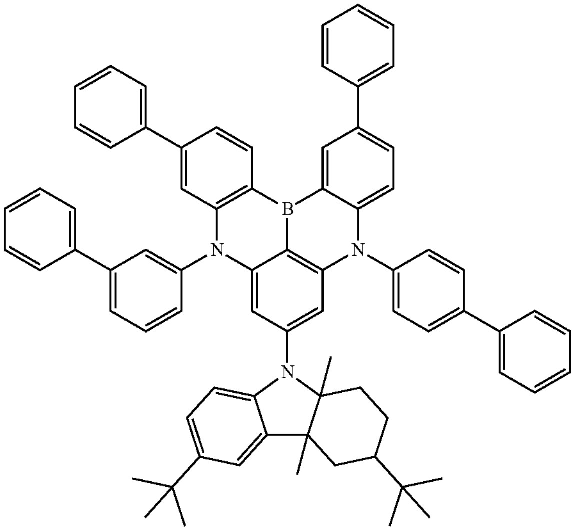
-continued
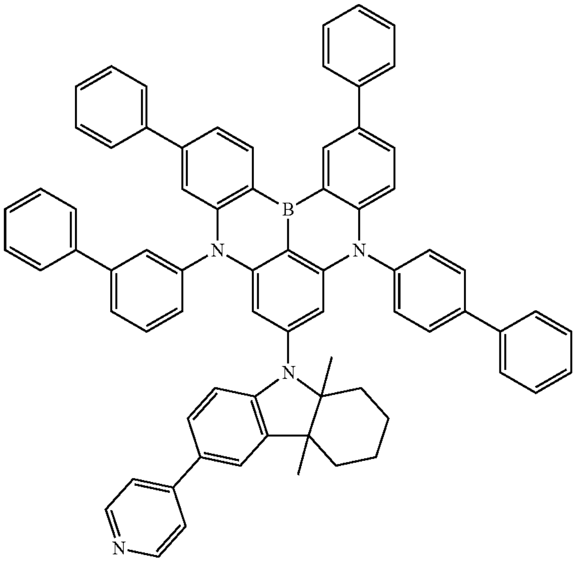
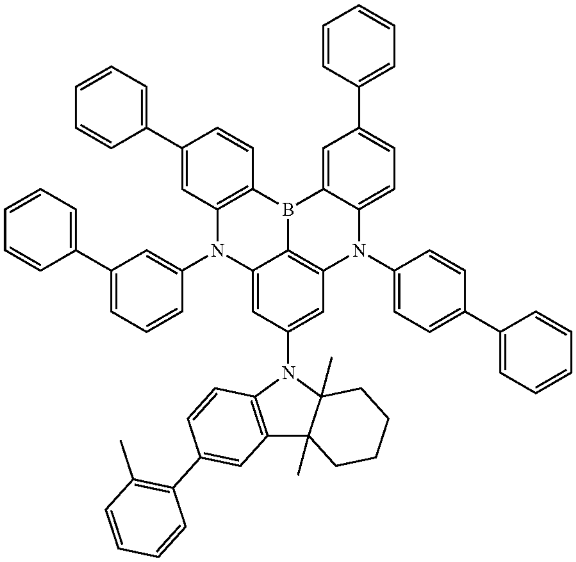
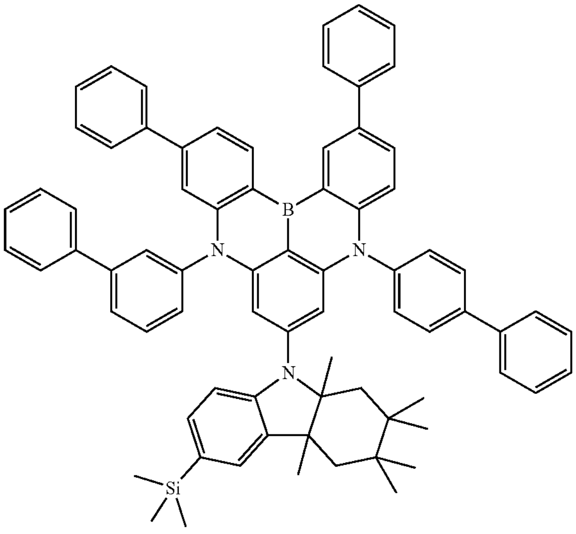

-continued
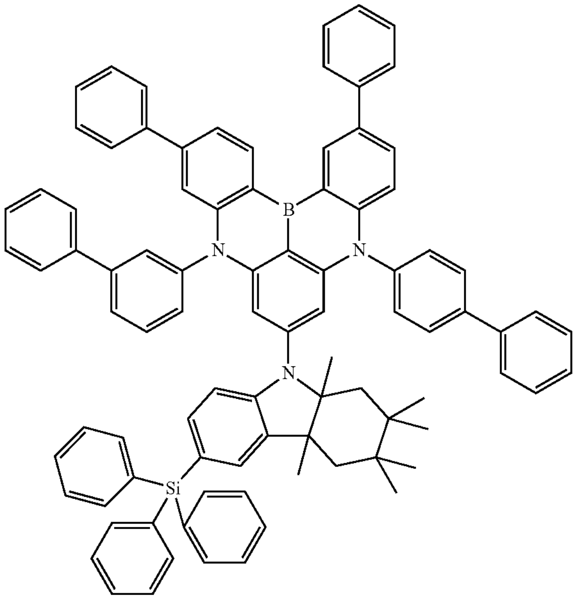
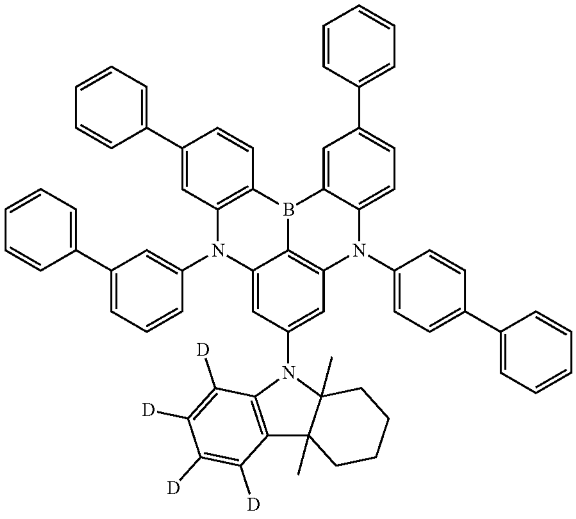
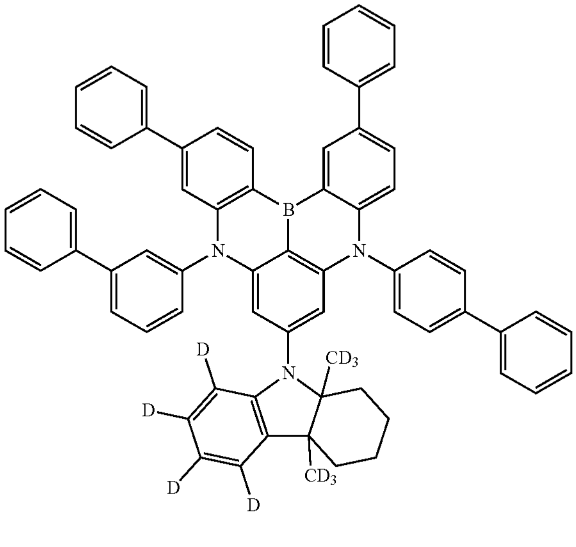
-continued
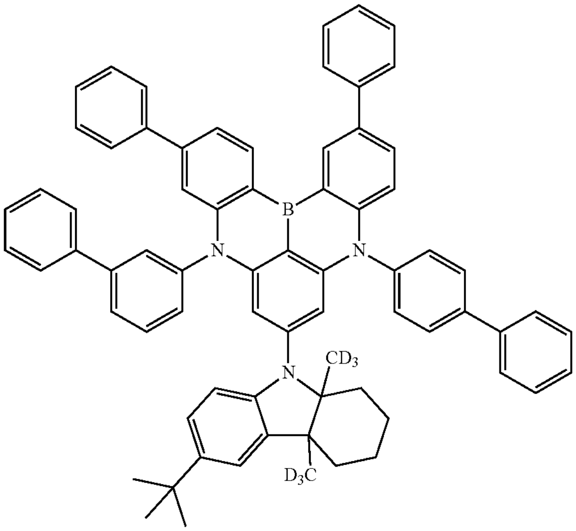
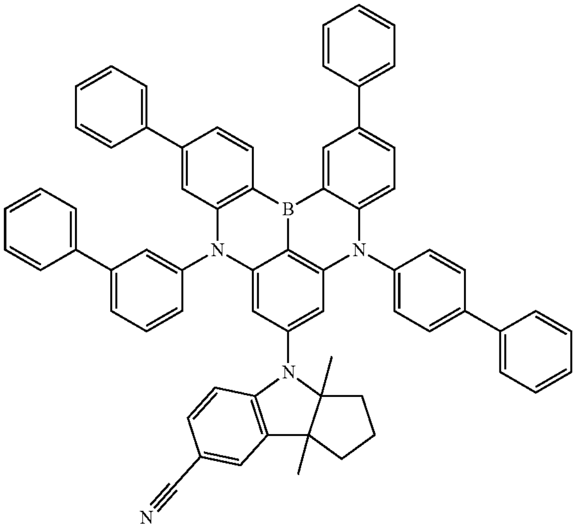
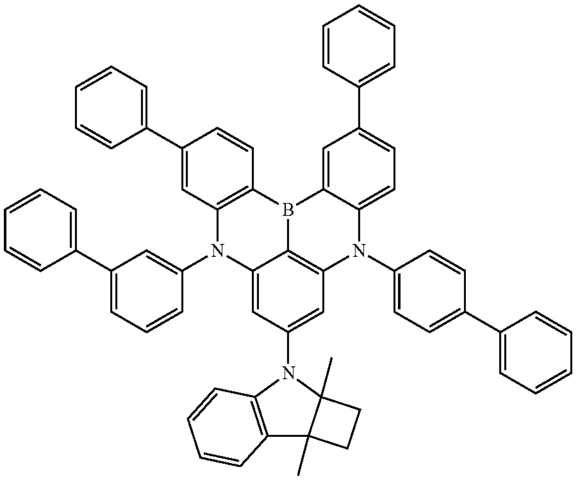

-continued
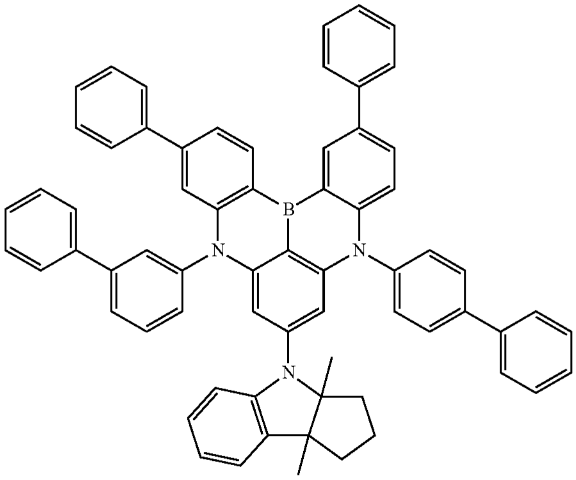
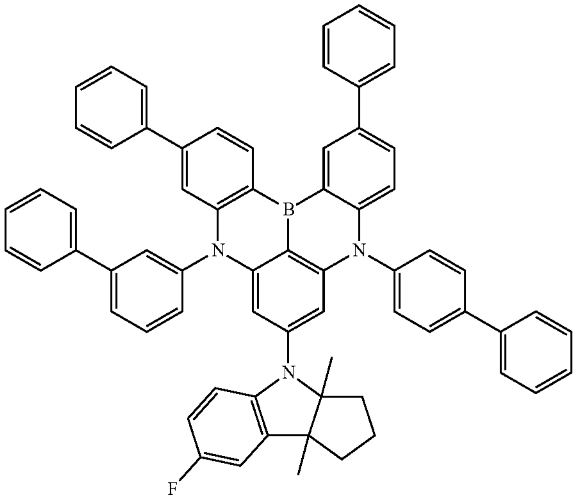 [SMILES: CC12CCCC1(C)N(c1cc3c4c(c1)N(c1cccc(-c5ccccc5)c1)c1cc(-c5ccccc5)ccc1B4c1cc(-c4ccccc4)ccc1N3c1ccc(-c3ccccc3)cc1)c1ccc(F)cc12]
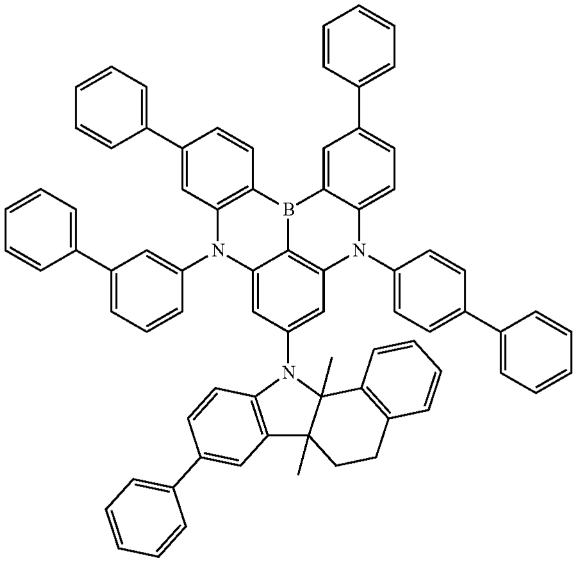
-continued
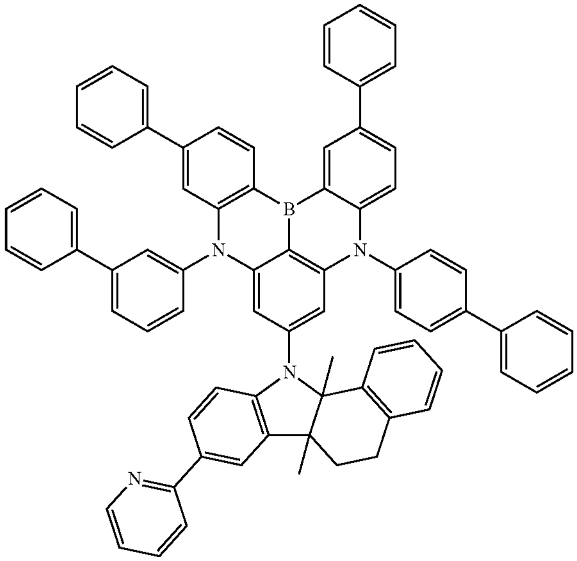
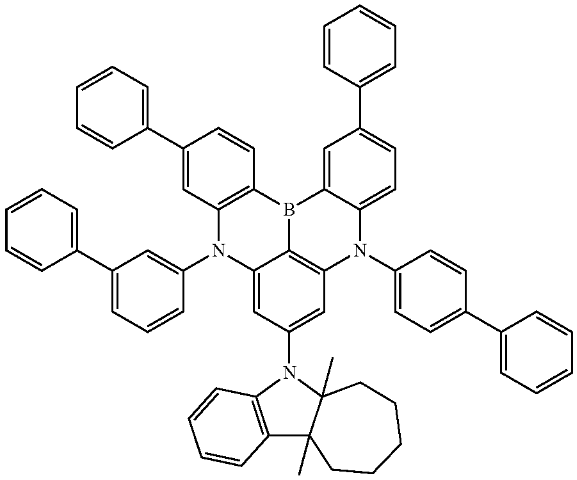
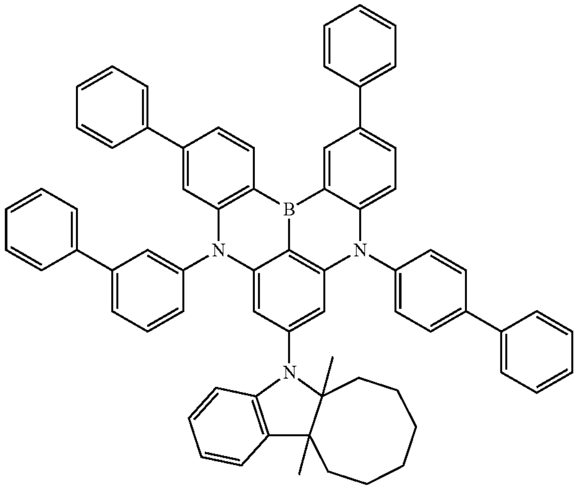

-continued
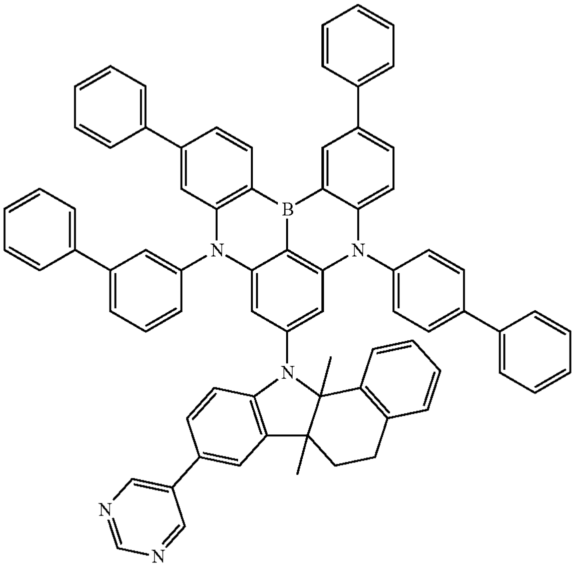
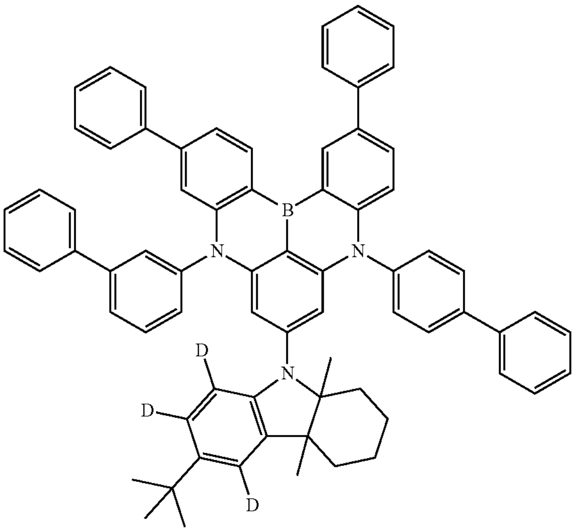
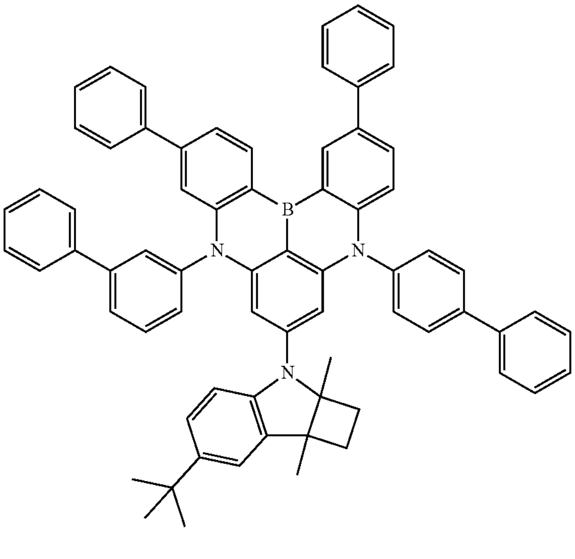
-continued
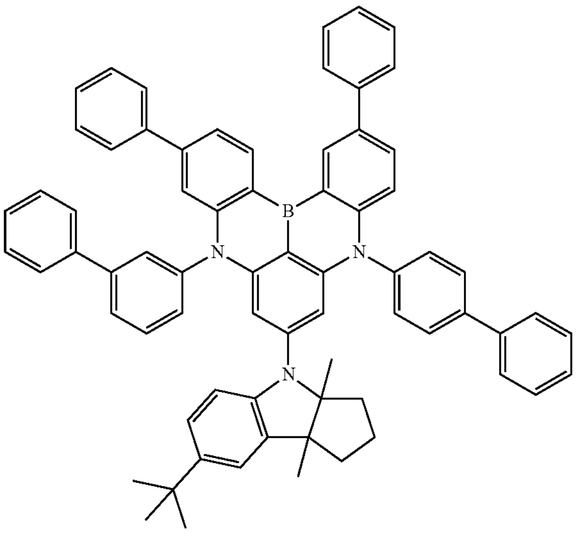
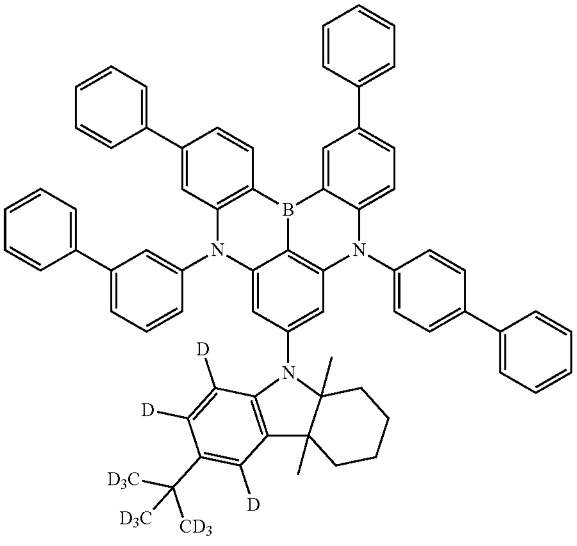
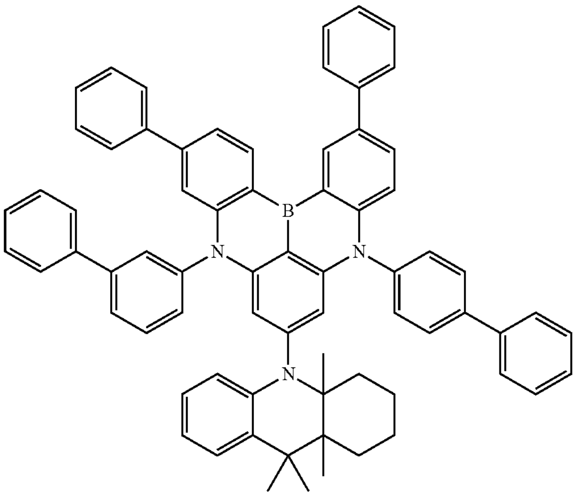

-continued
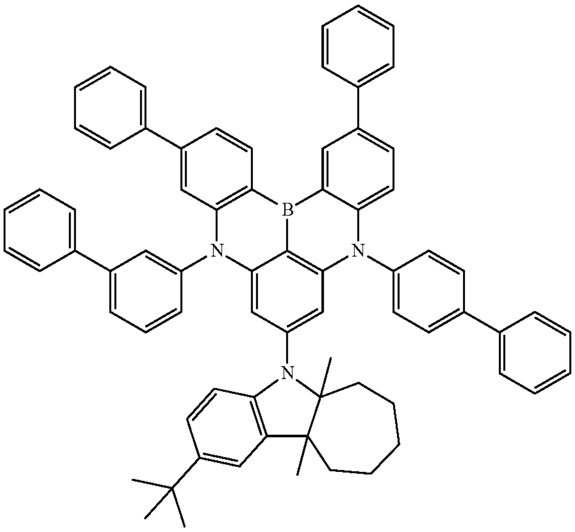
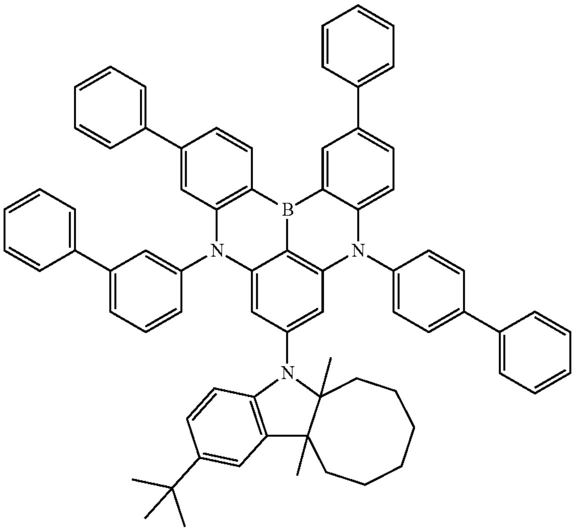
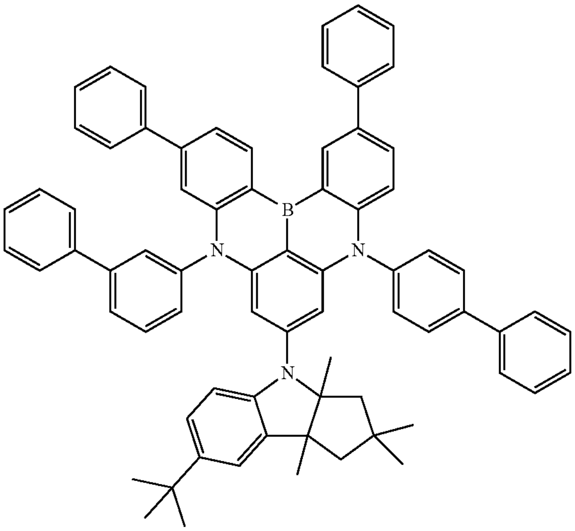
-continued
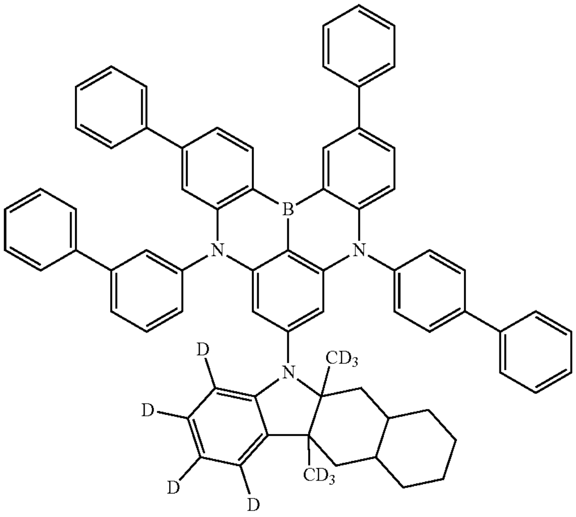
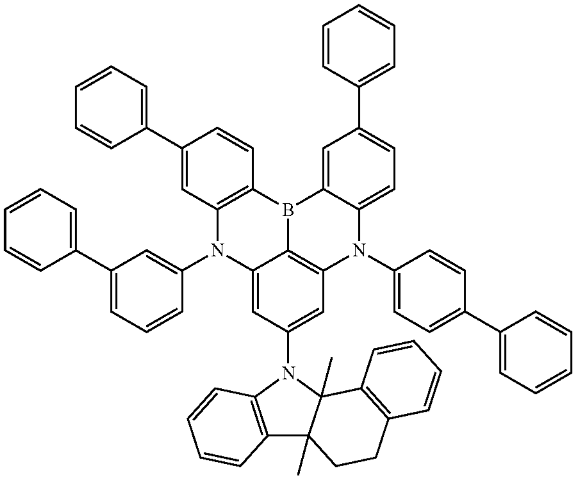
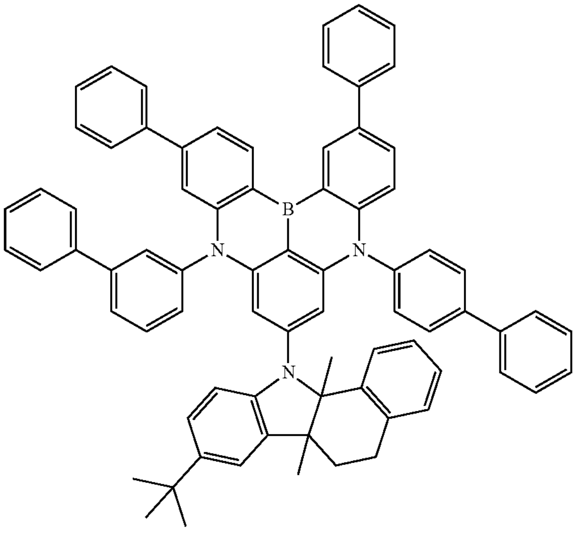

-continued
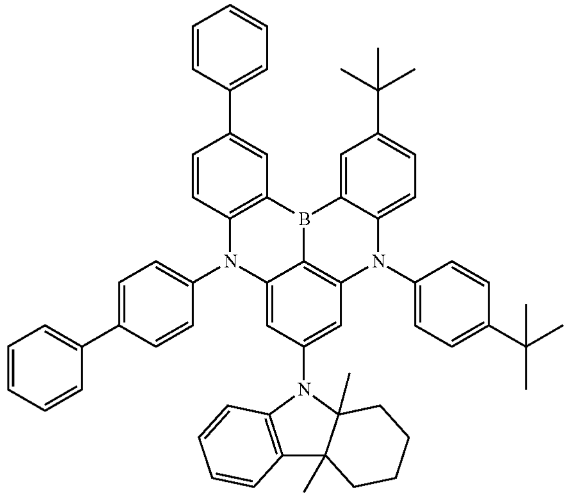
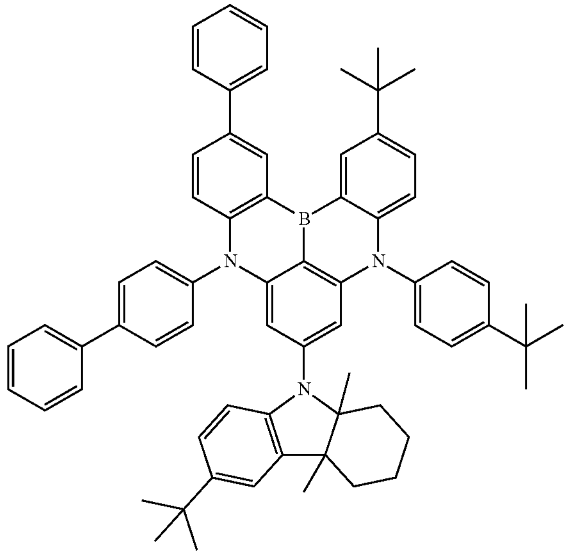
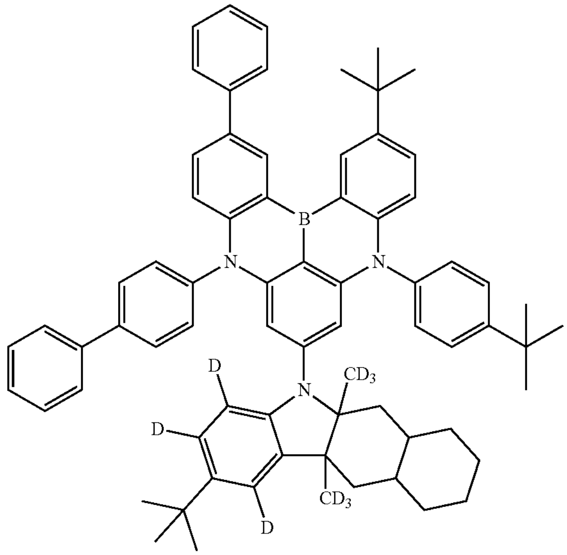
-continued
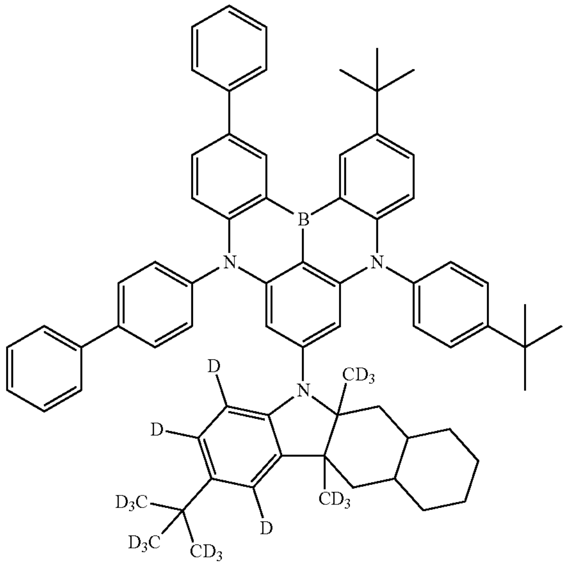
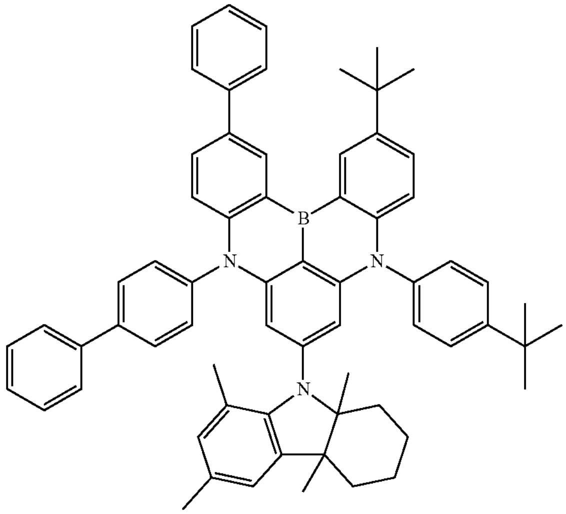
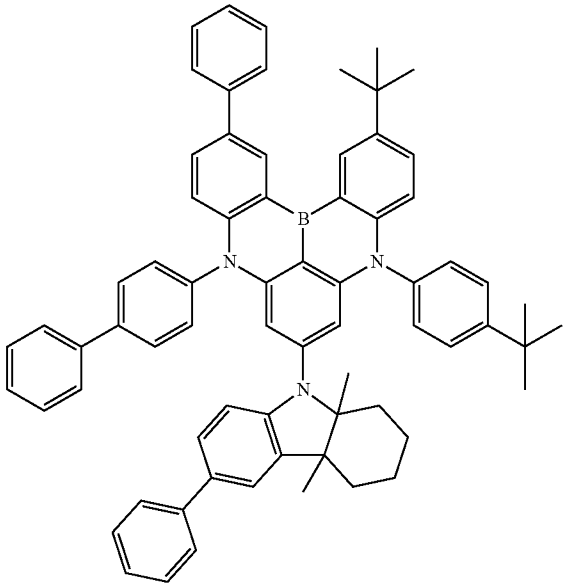

-continued
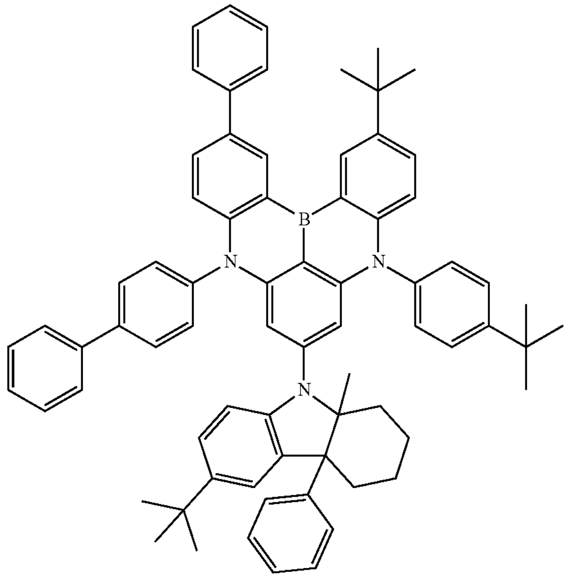
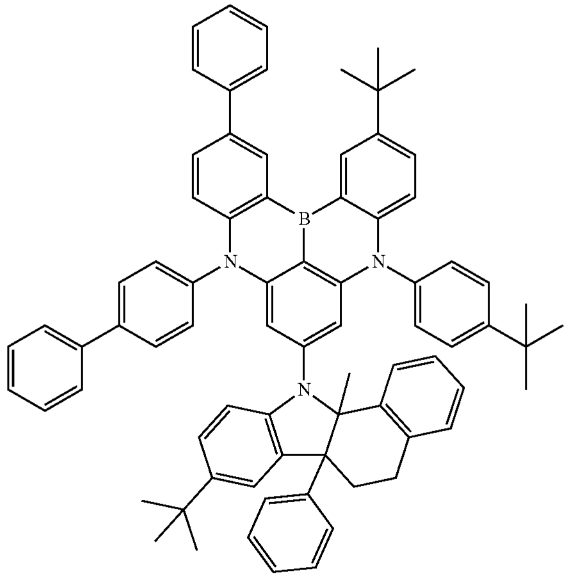
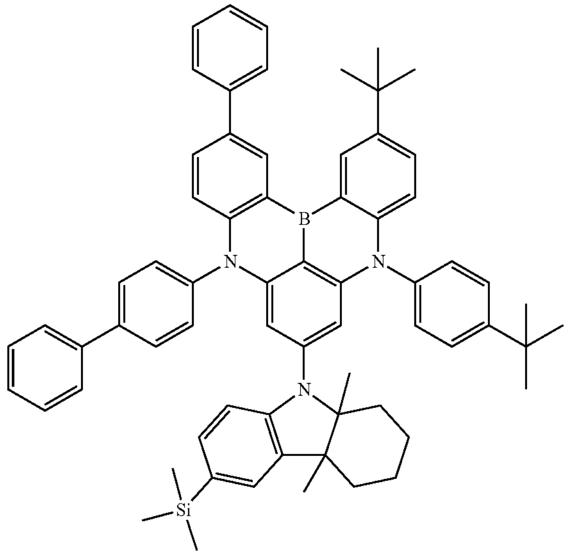
-continued
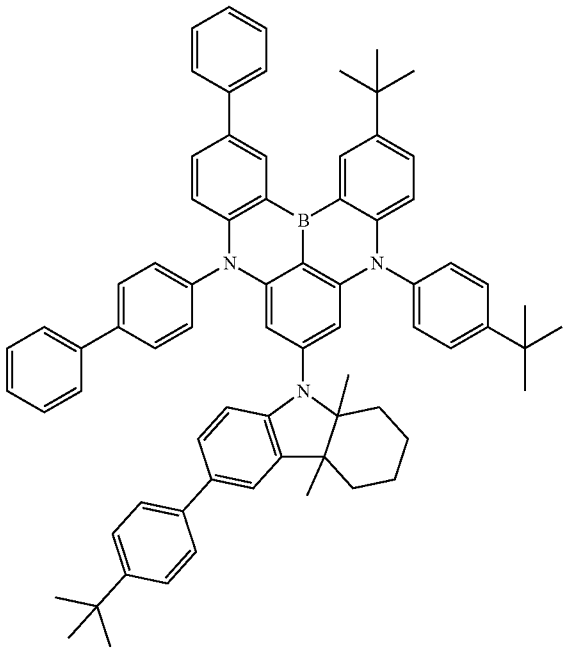
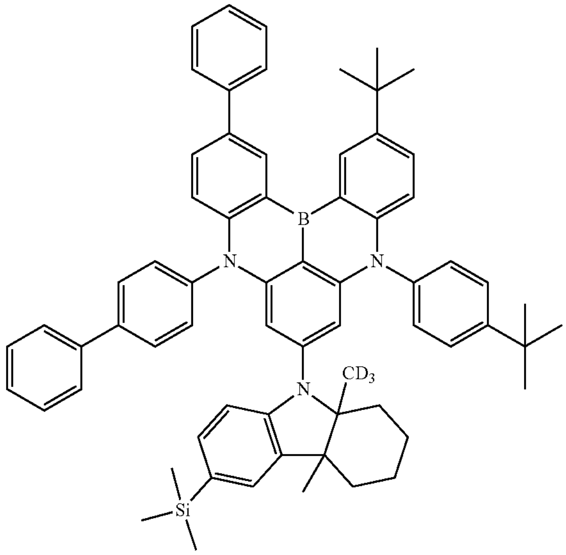

-continued
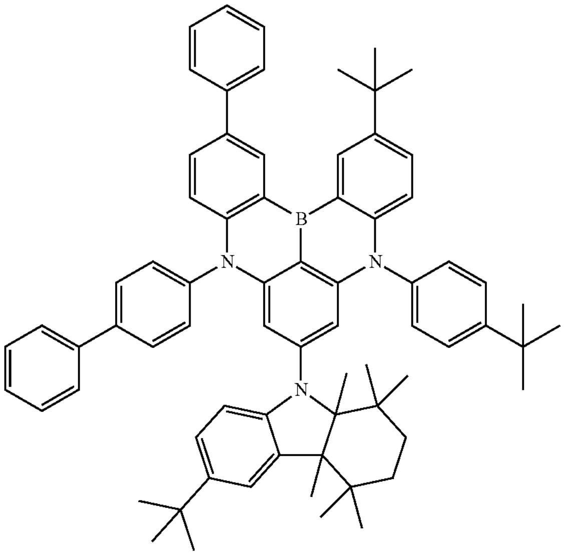
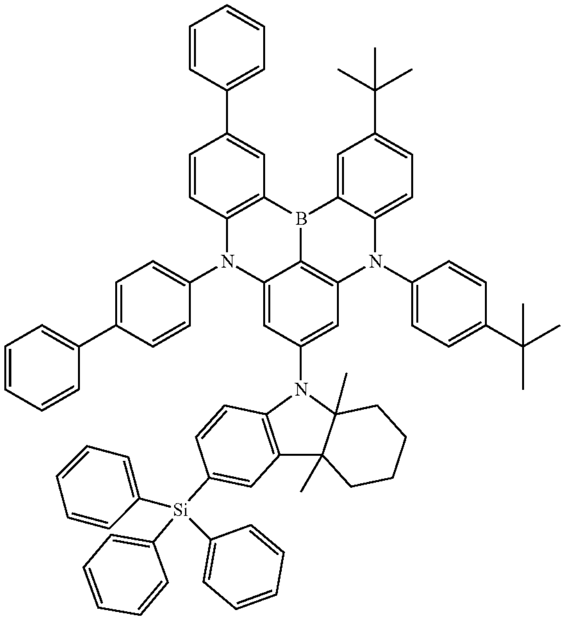
-continued
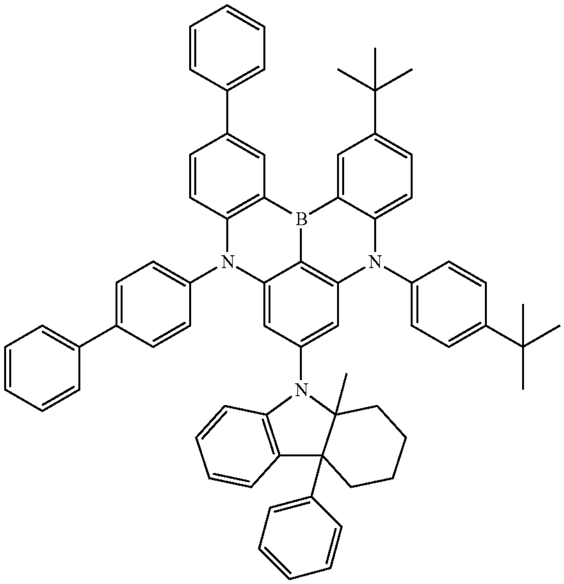
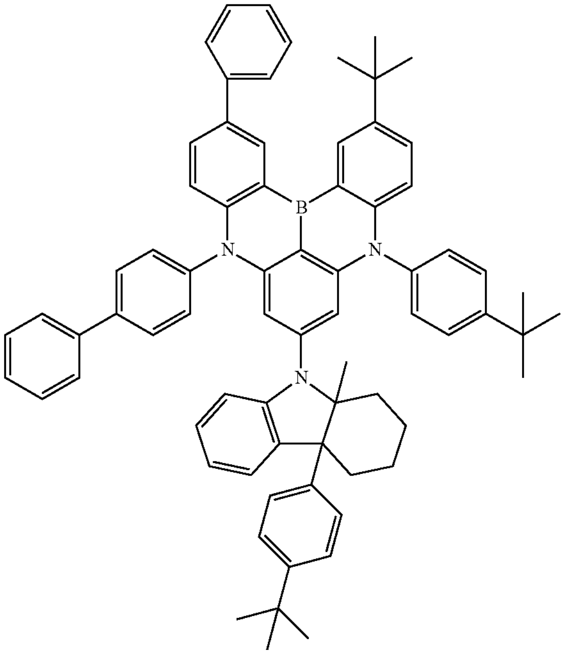

-continued
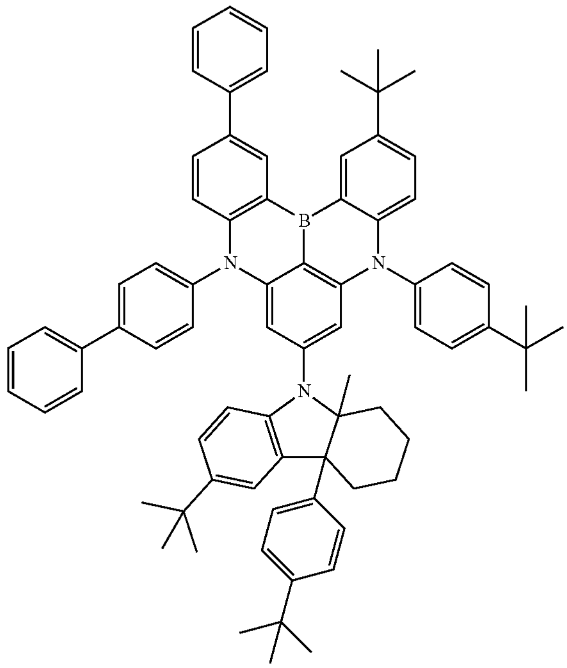
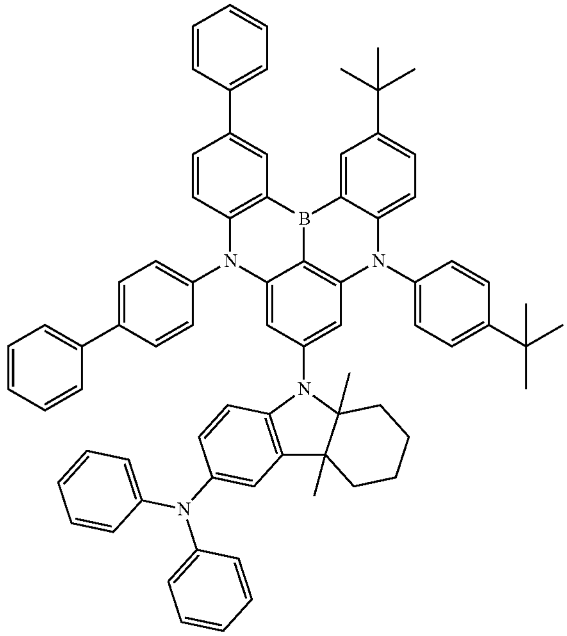
-continued
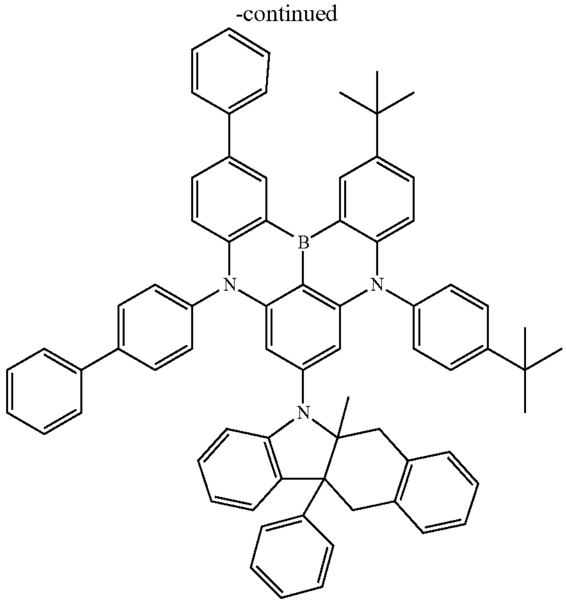
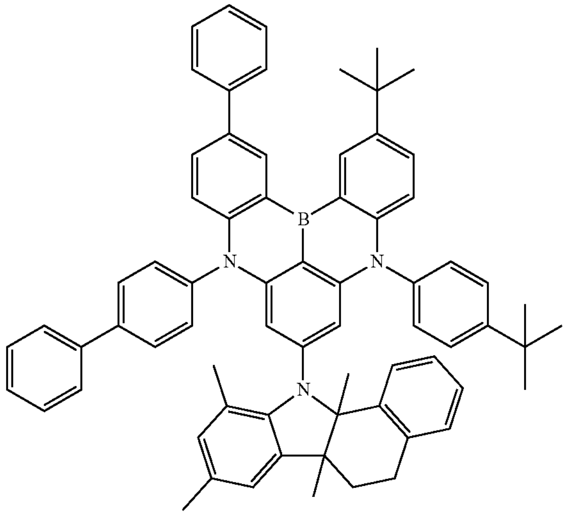
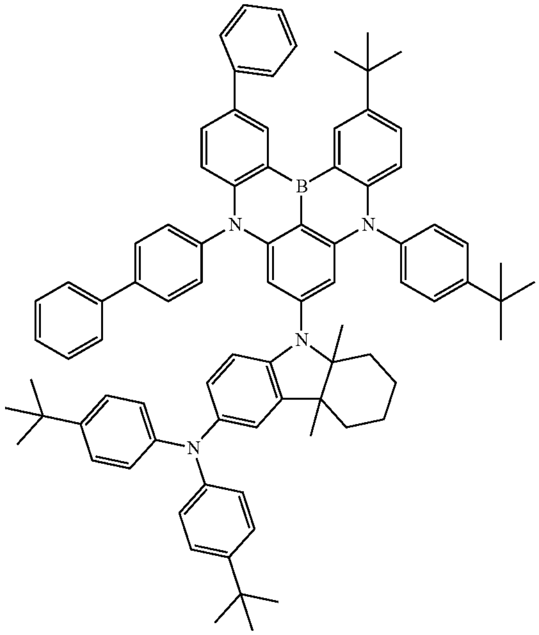

-continued
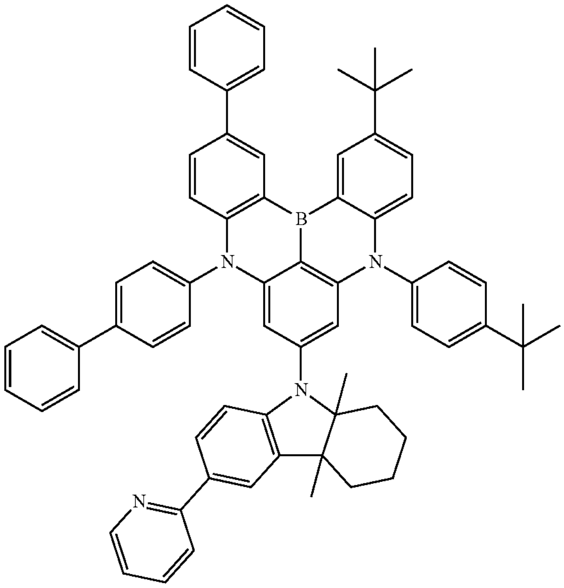
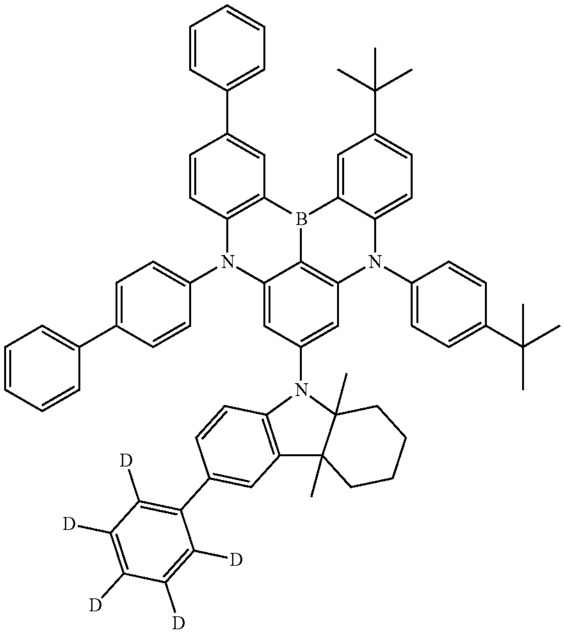
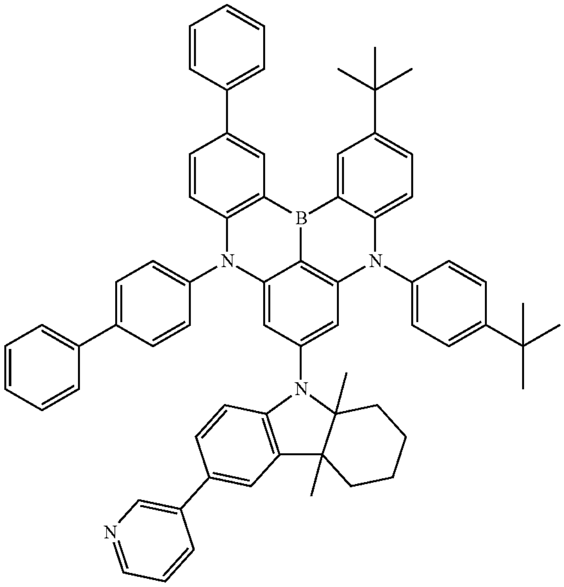
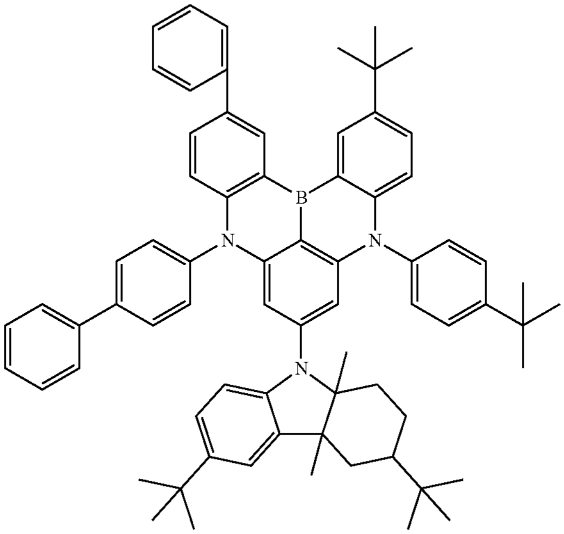
-continued

-continued
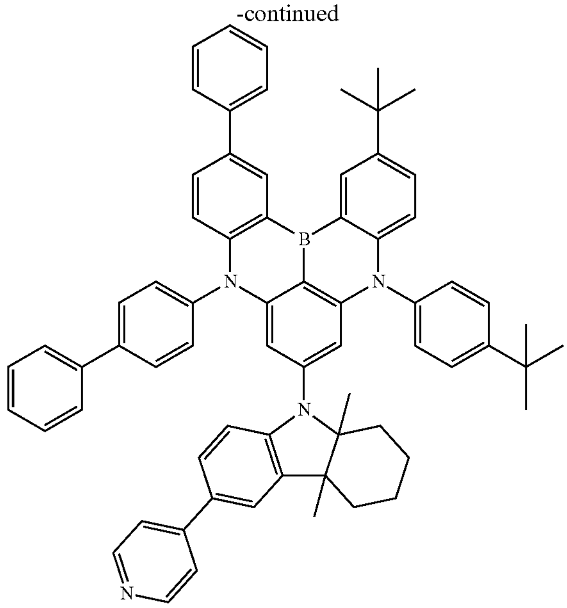
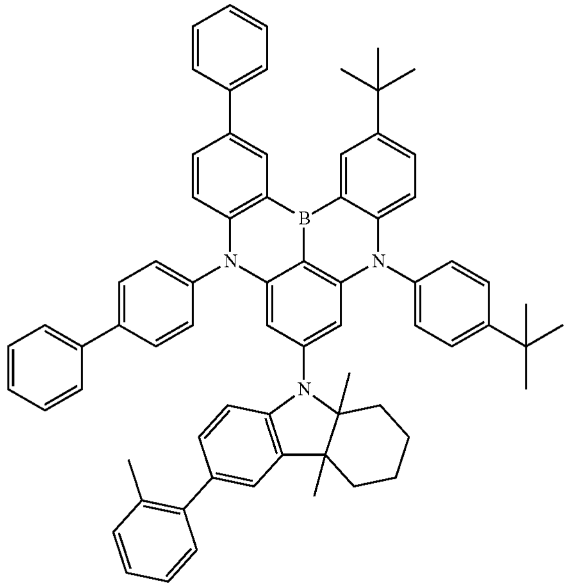
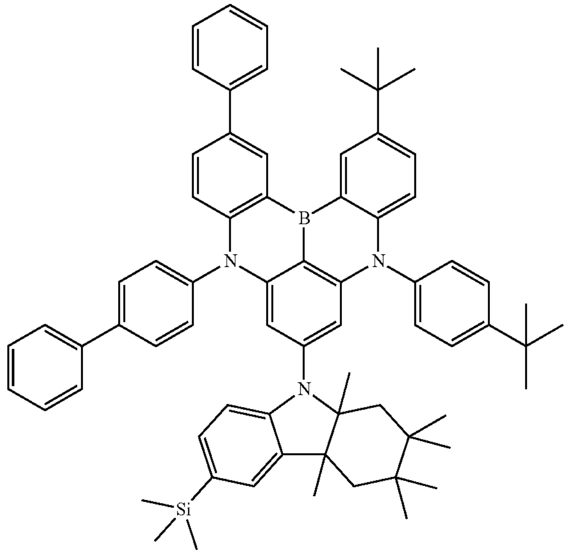
-continued
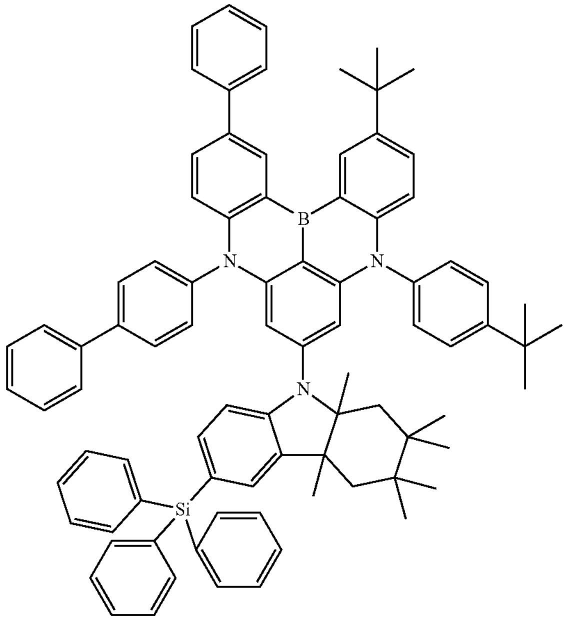
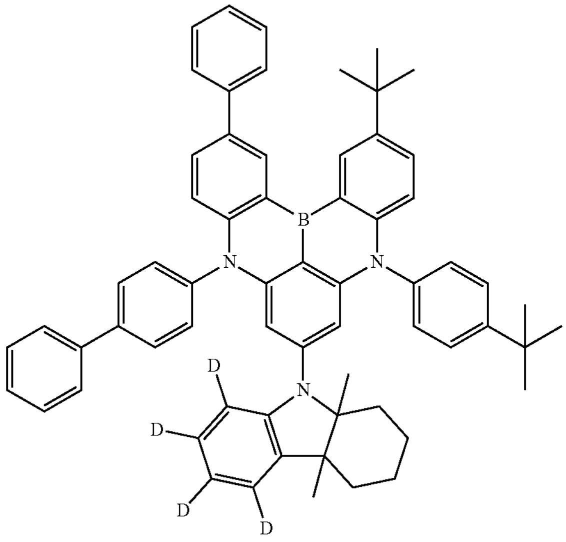
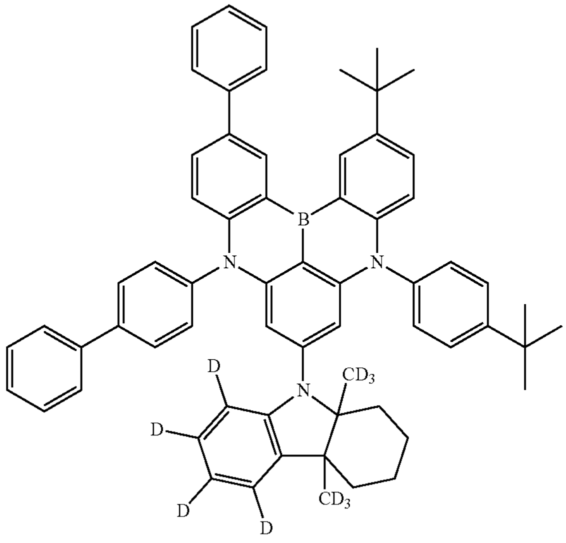

-continued
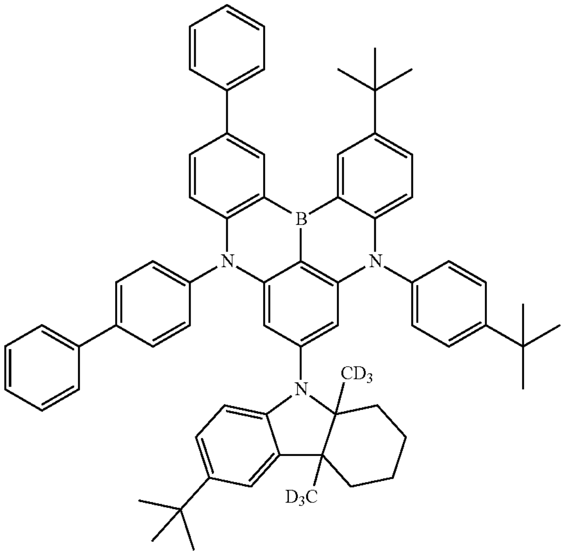
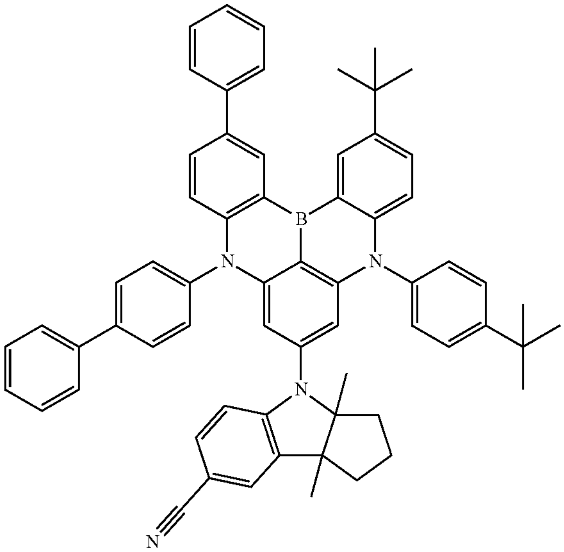
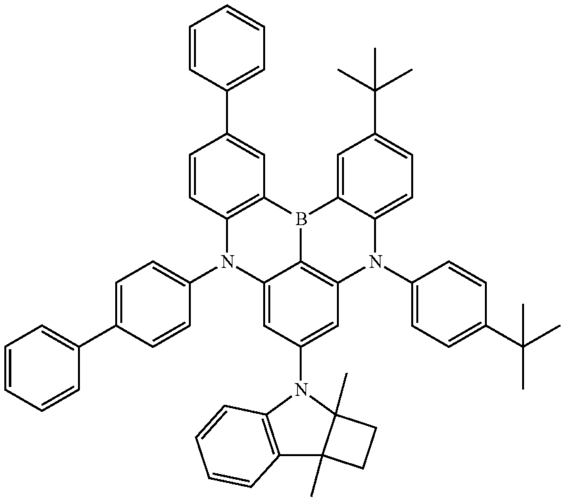
-continued
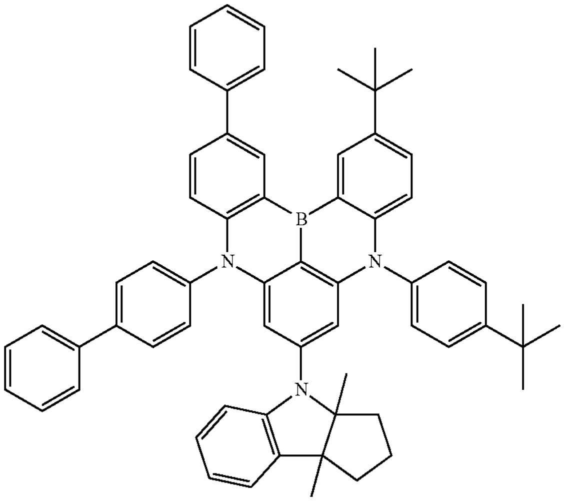
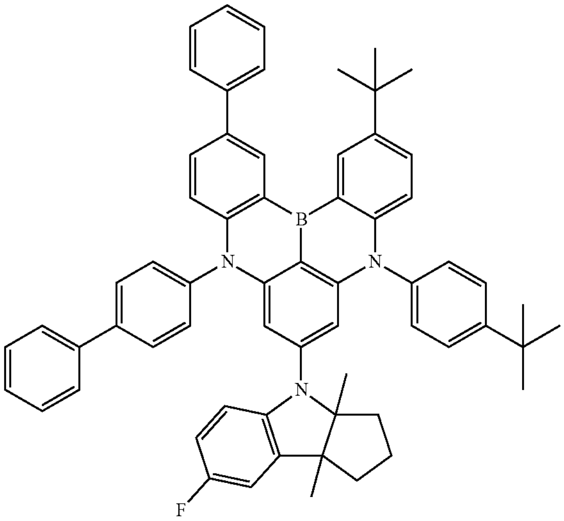 [SMILES: CC(C)(C)c1ccc(N2c3ccc(C(C)(C)C)cc3B3c4cc(-c5ccccc5)ccc4N(c4ccc(-c5ccccc5)cc4)c4cc(N5c6ccc(F)cc6C6(C)CCCC56C)cc2c43)cc1]
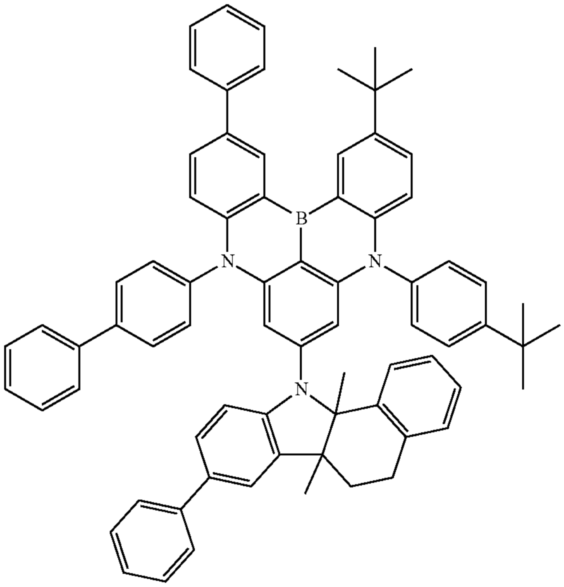

-continued
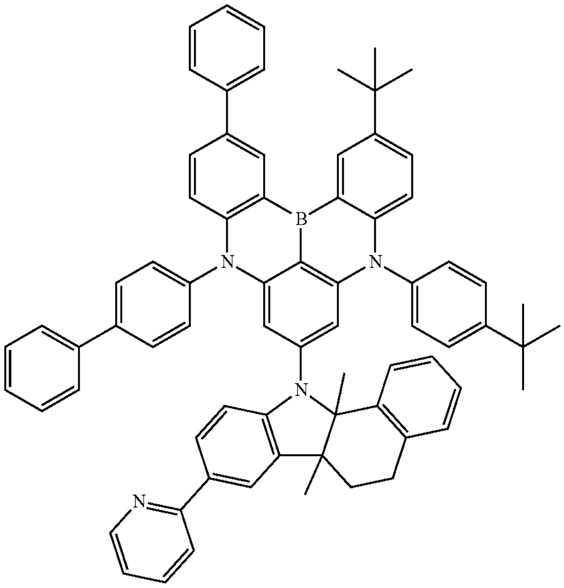
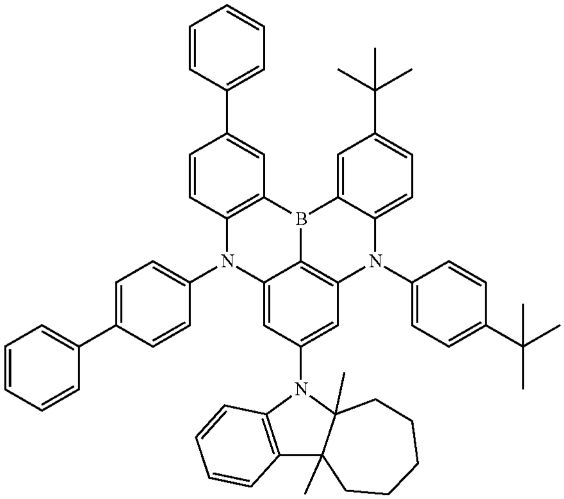
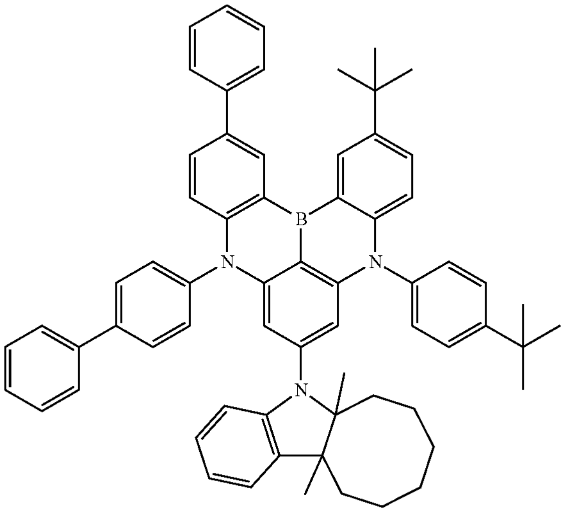
-continued
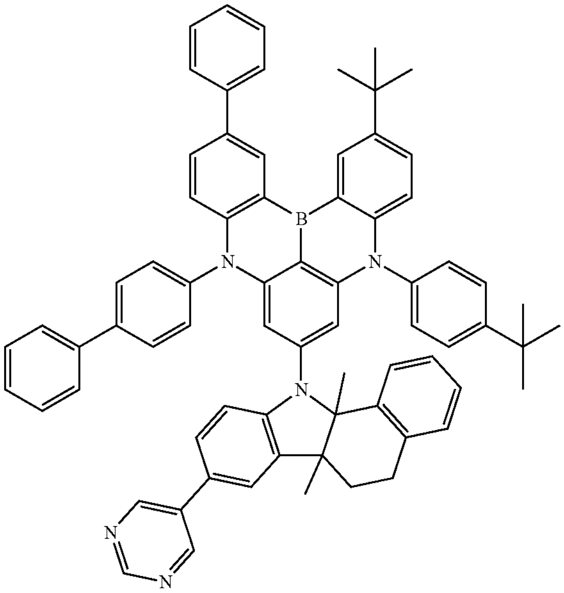
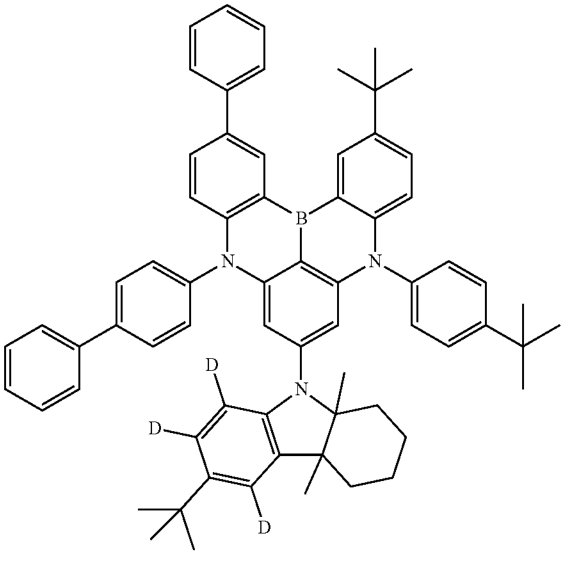
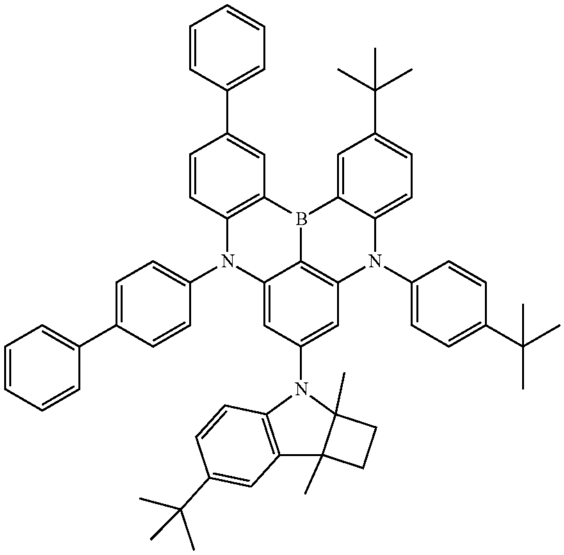

-continued
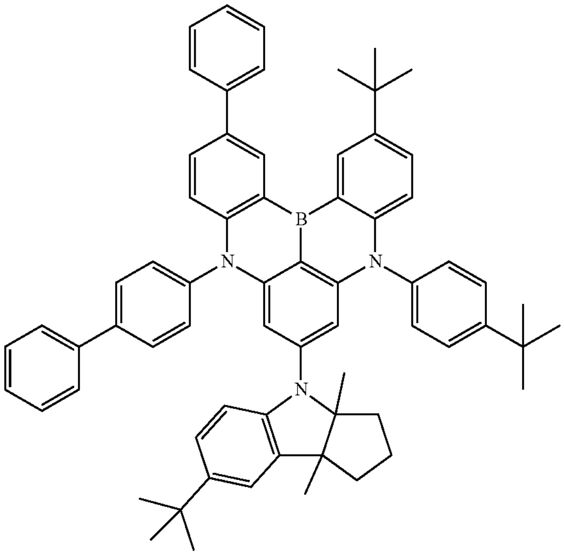
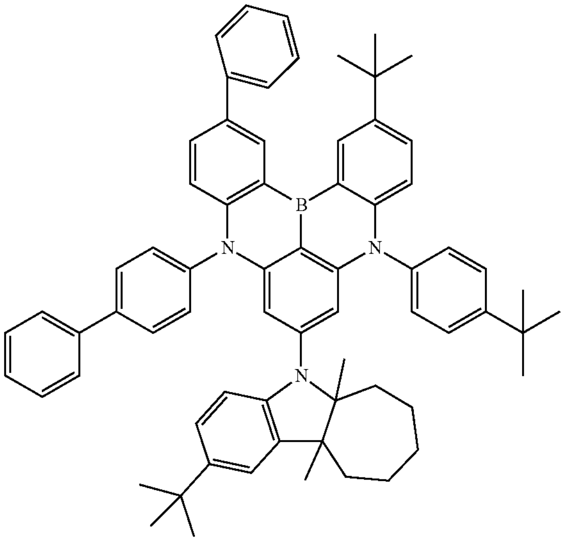
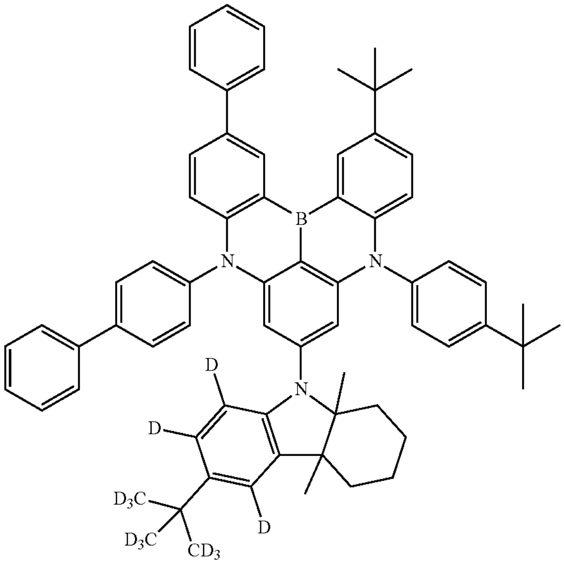
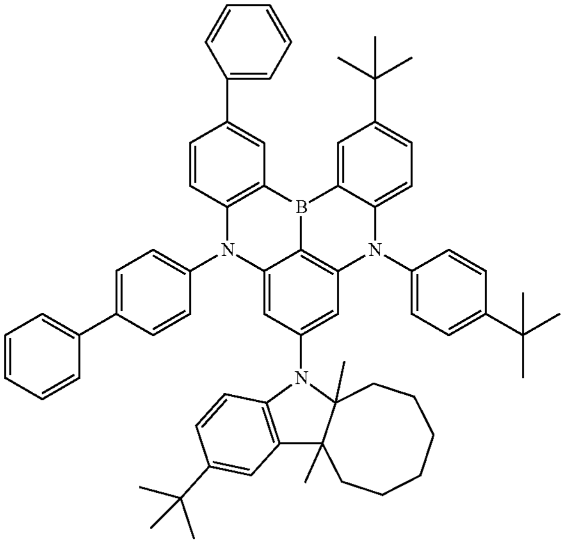
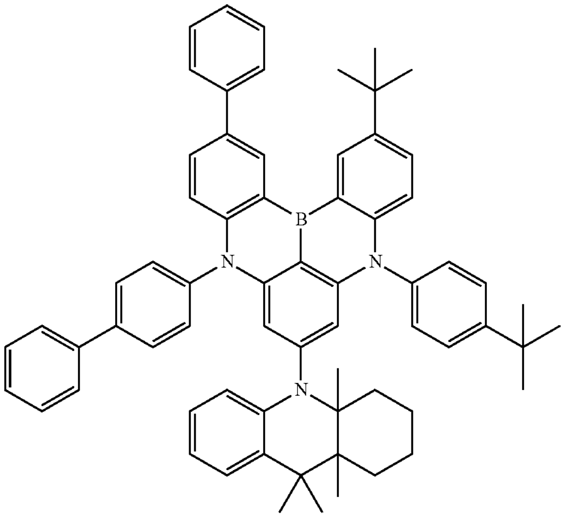
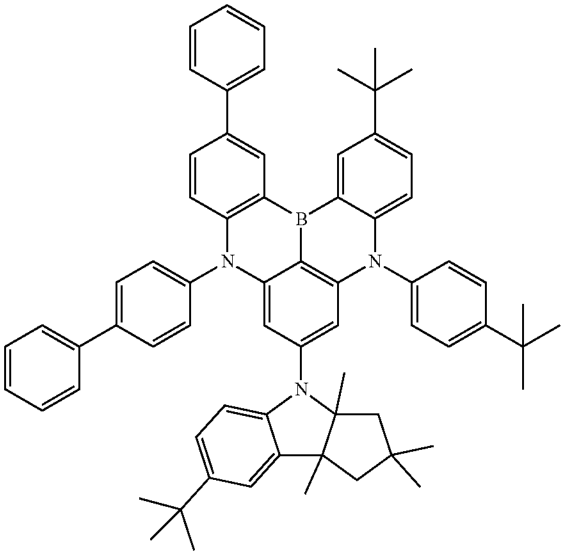

-continued
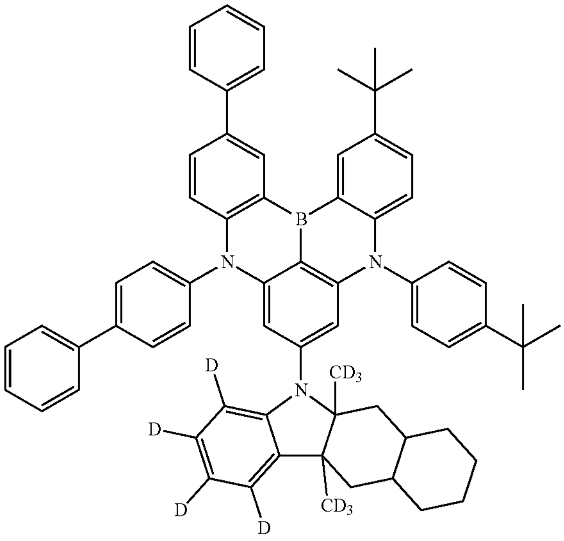
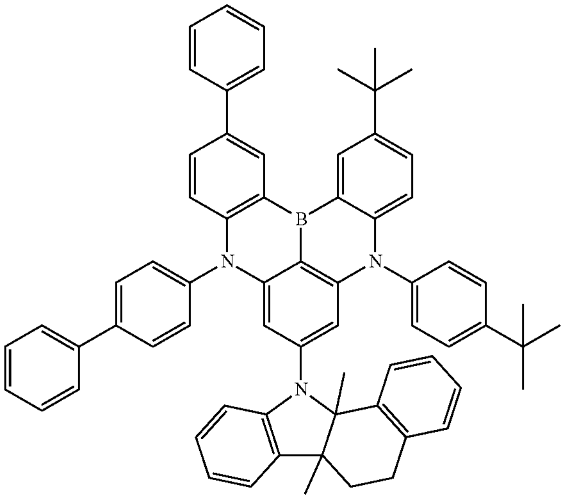
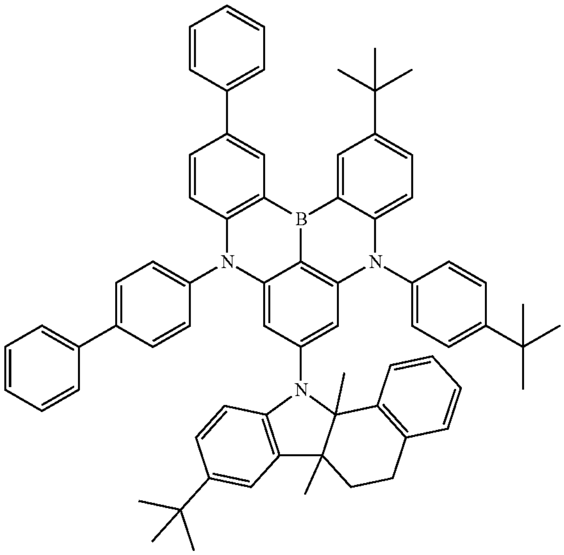
-continued
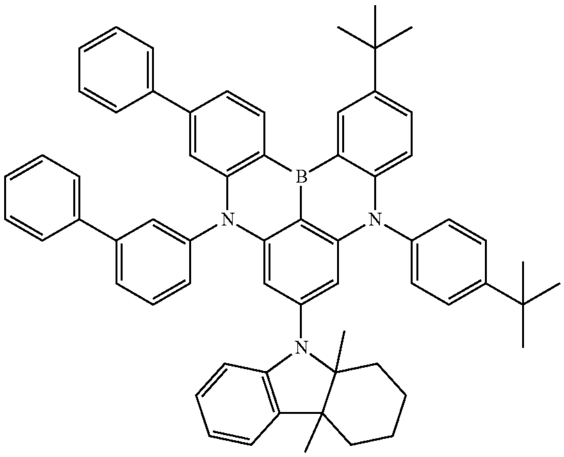
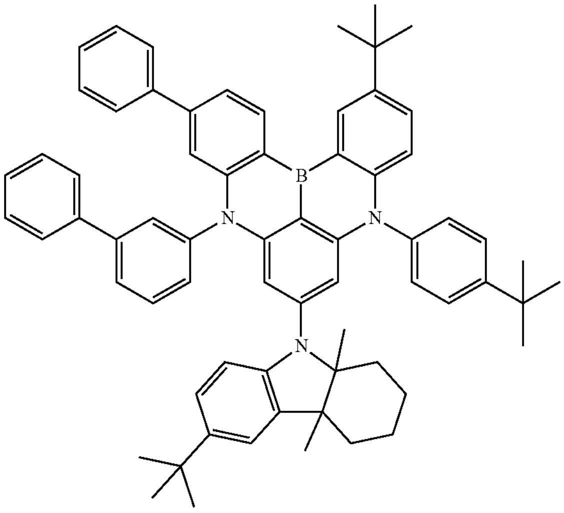
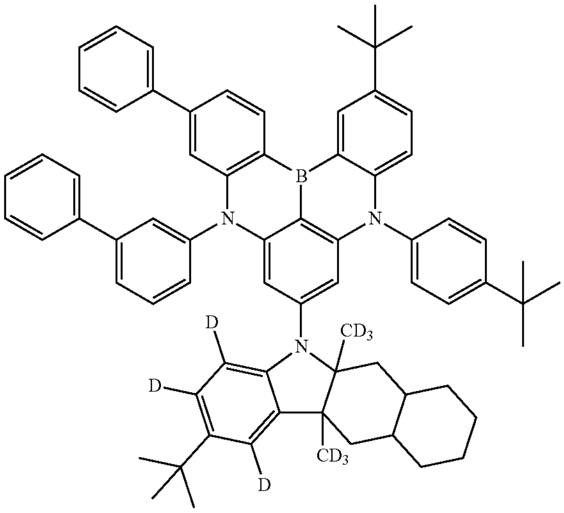

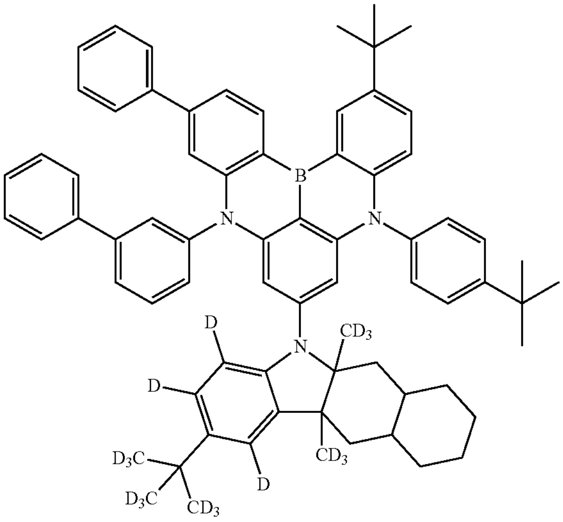
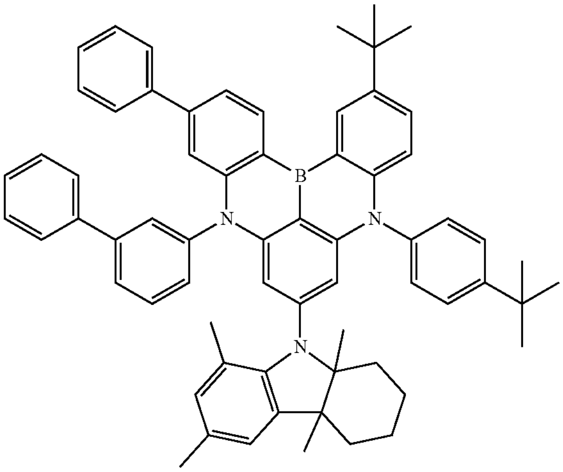
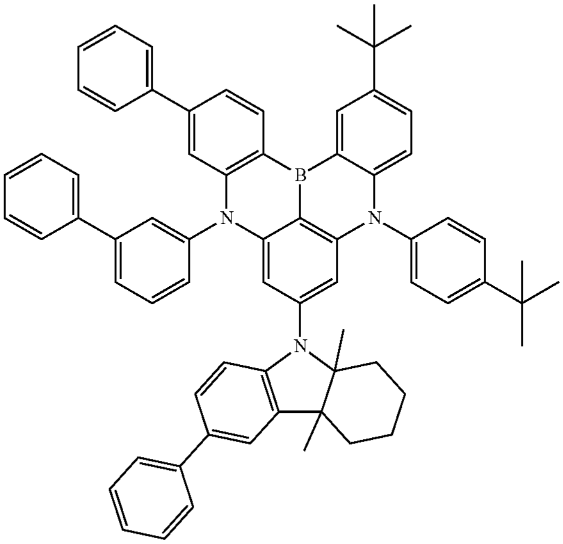
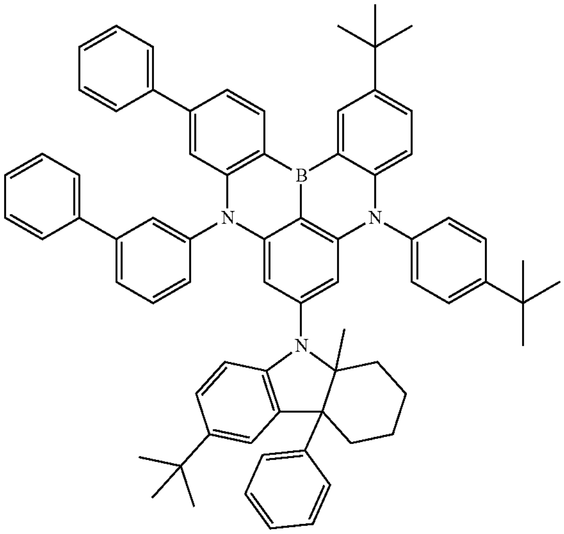
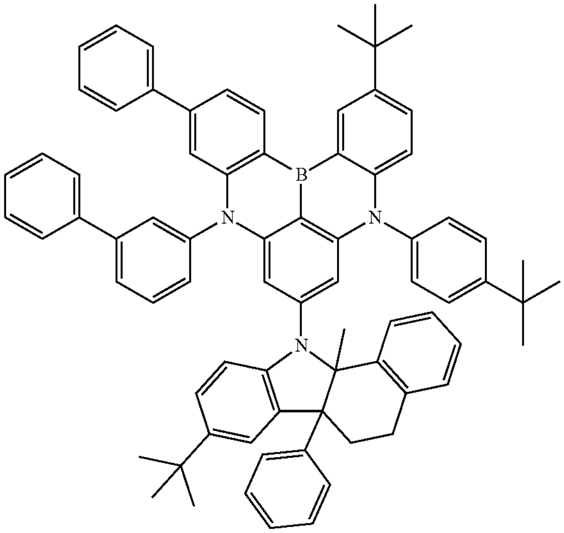
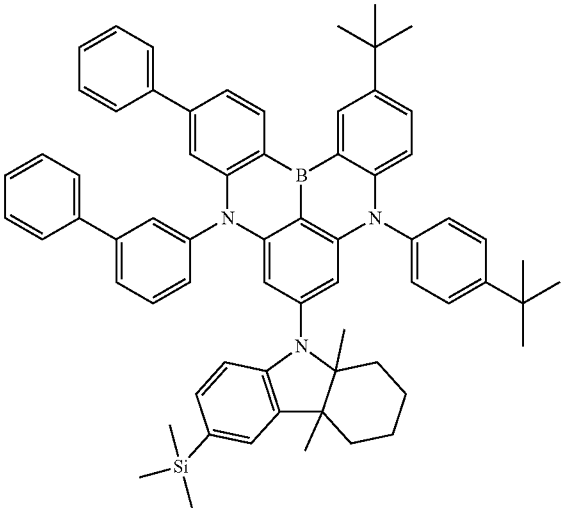

-continued
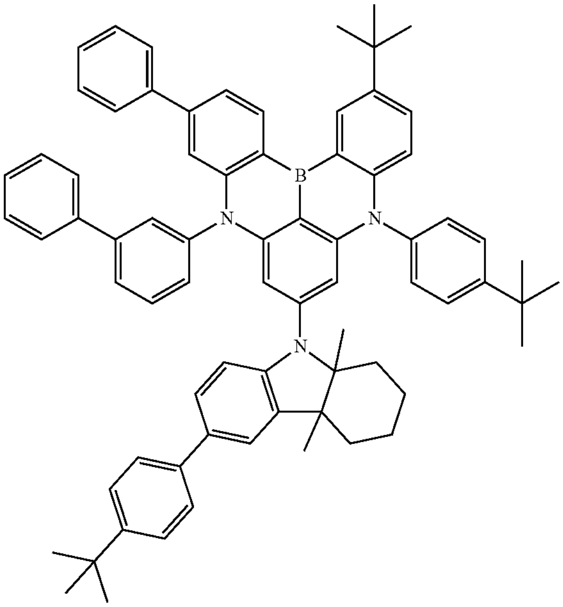
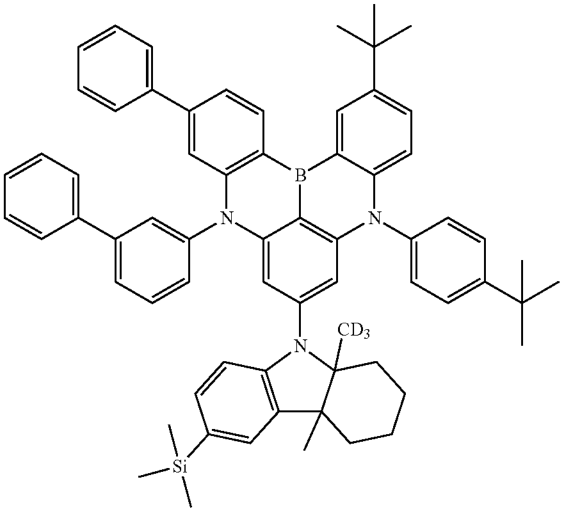
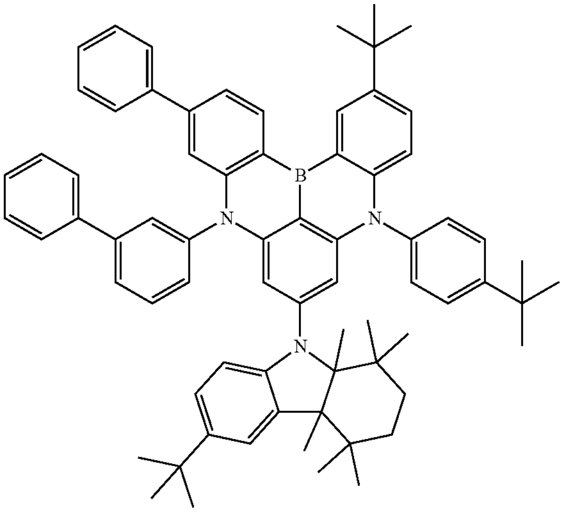
-continued
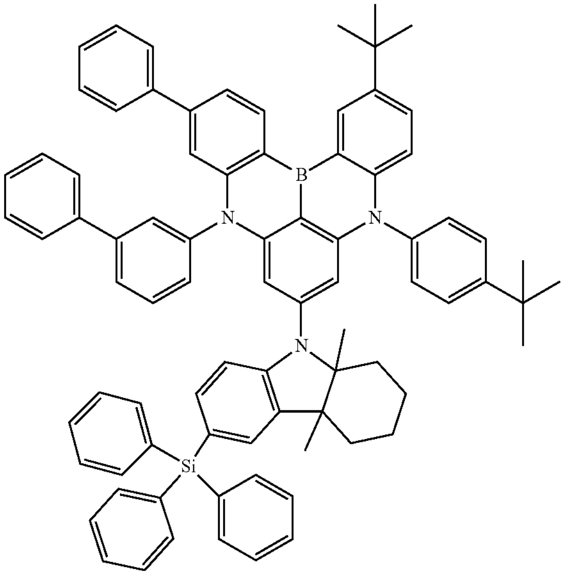
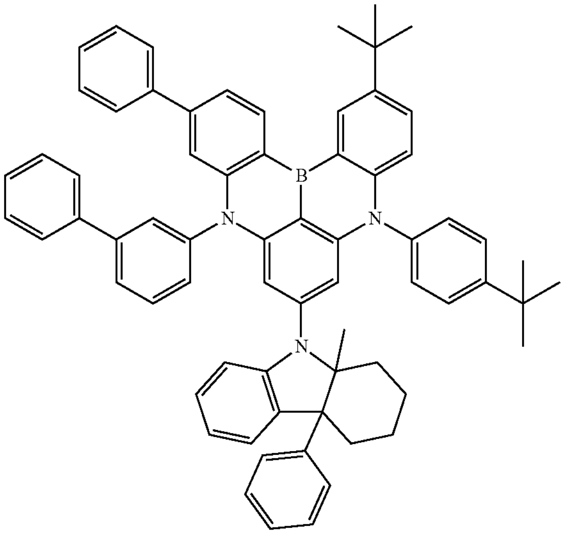
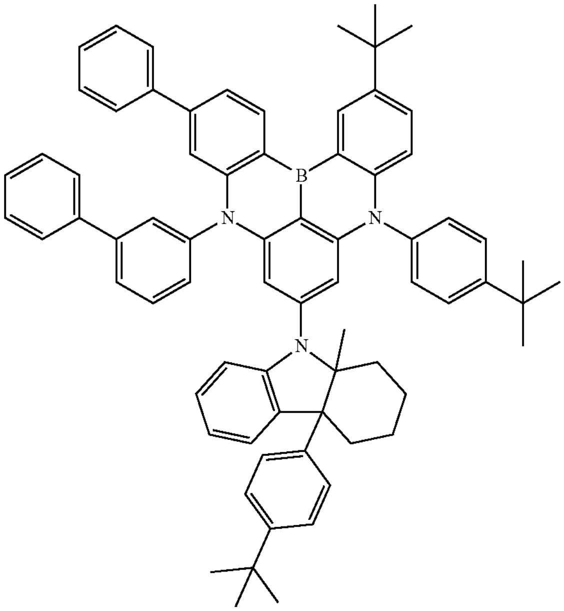

-continued
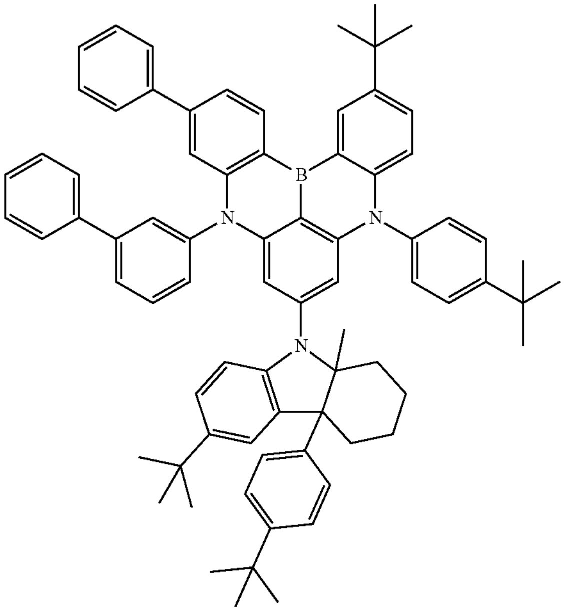
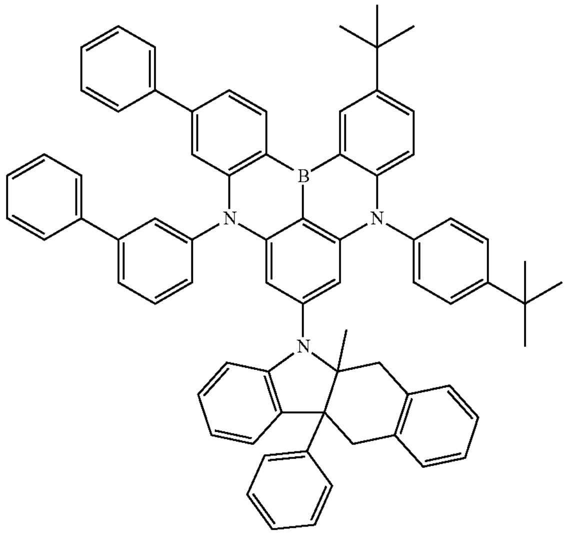
-continued
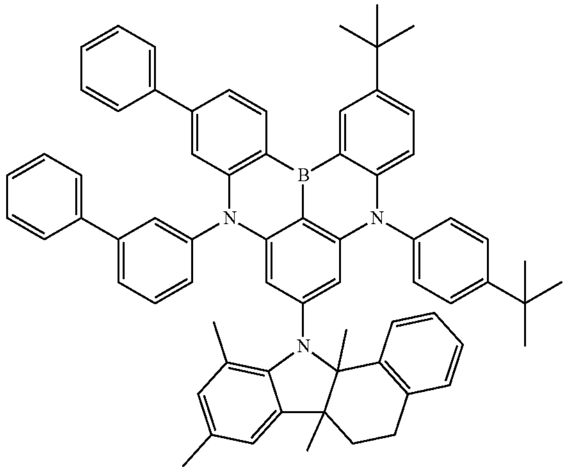
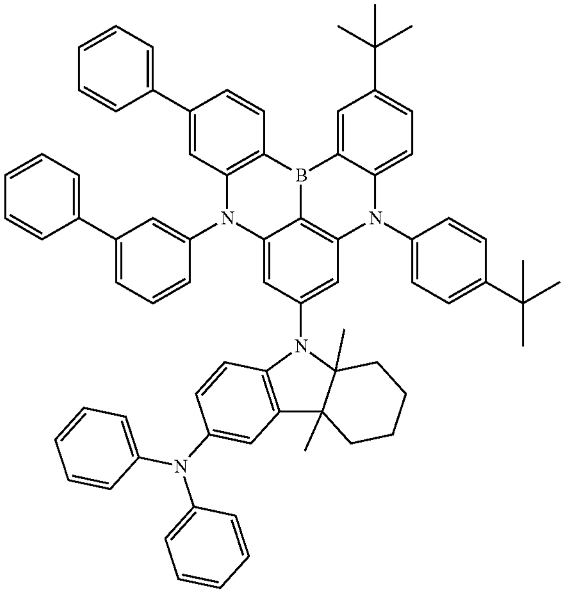
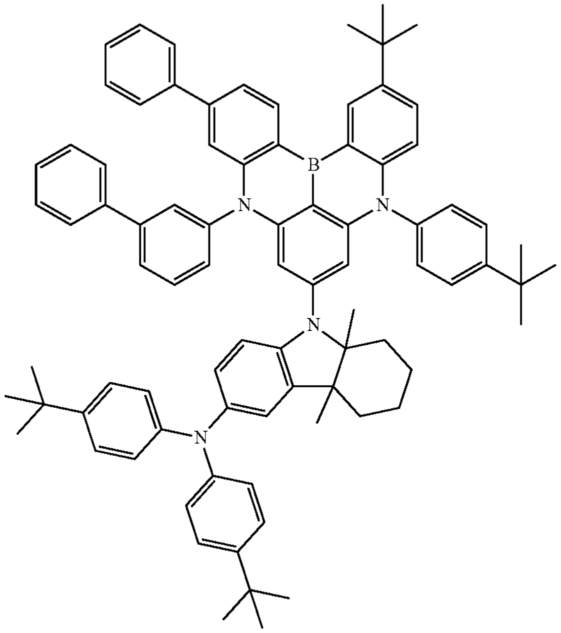

-continued
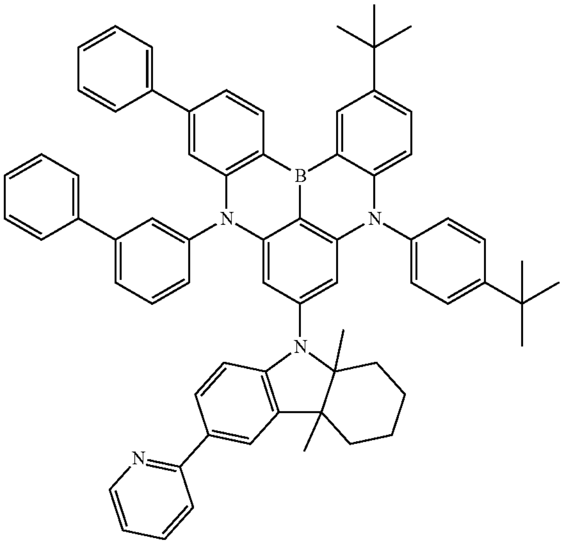
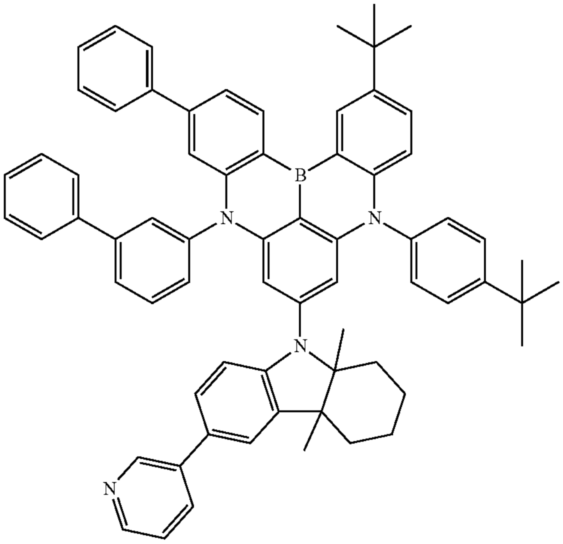
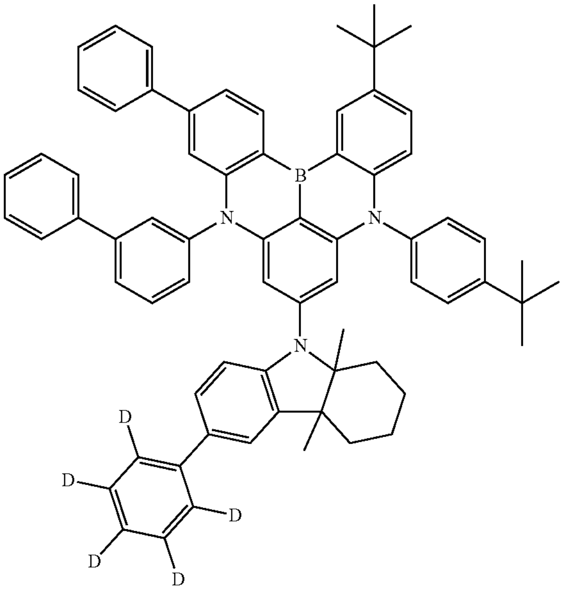
-continued
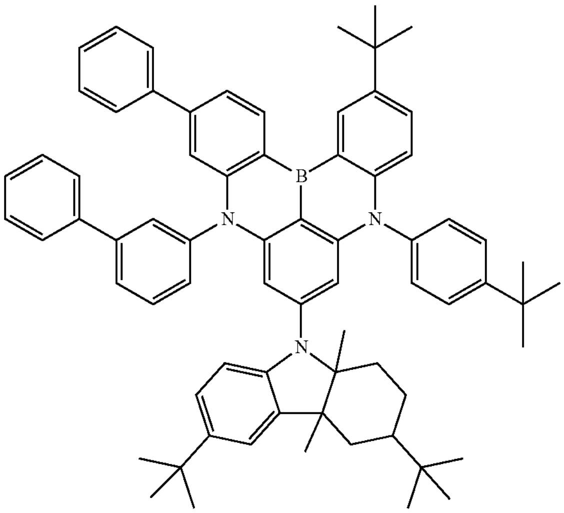
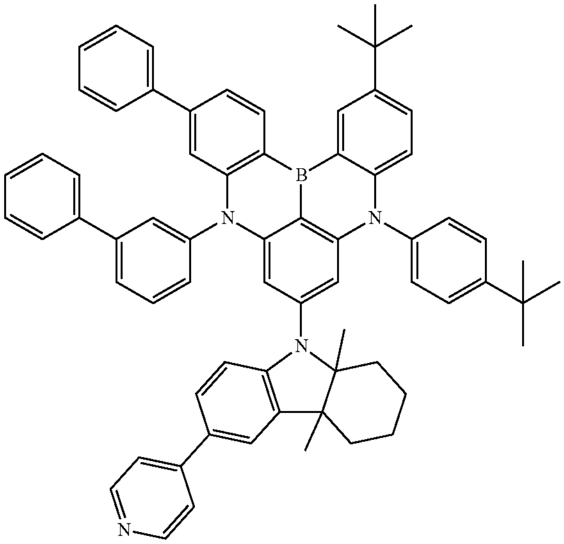
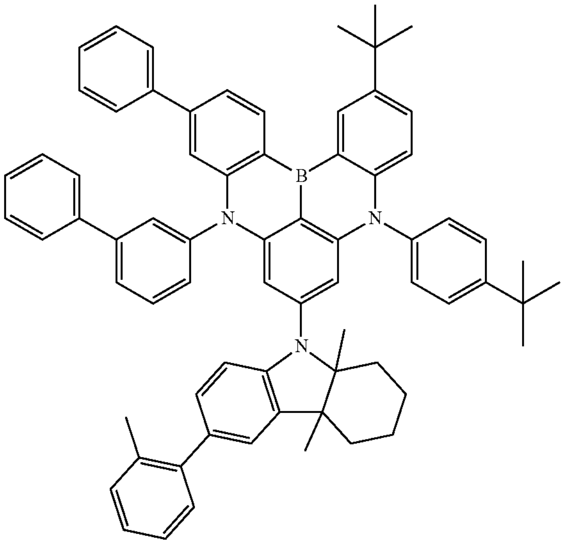

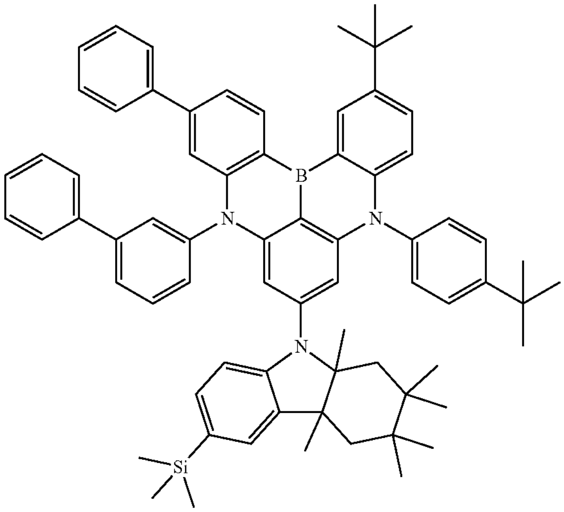
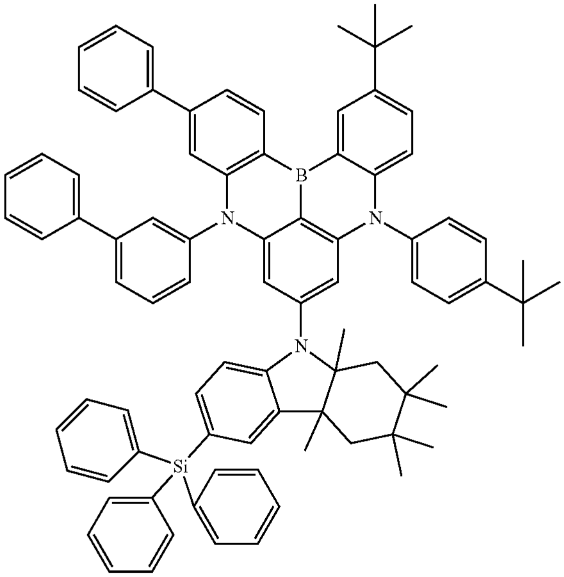
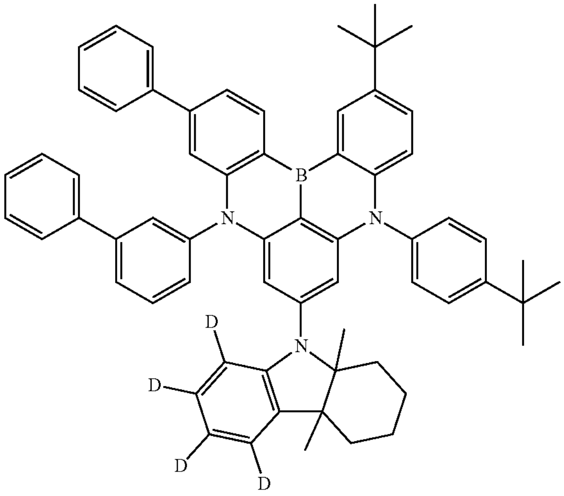
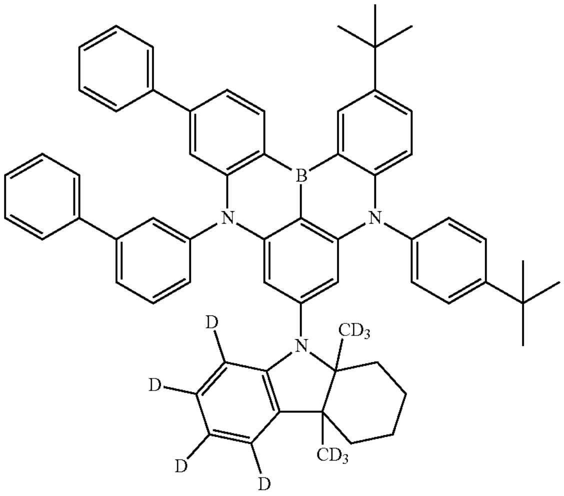
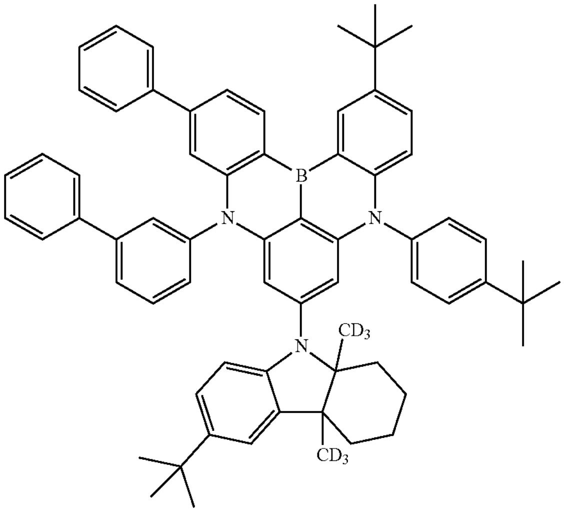
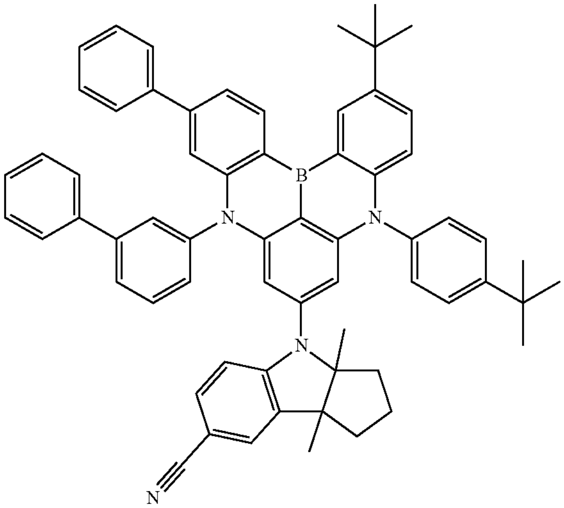

-continued
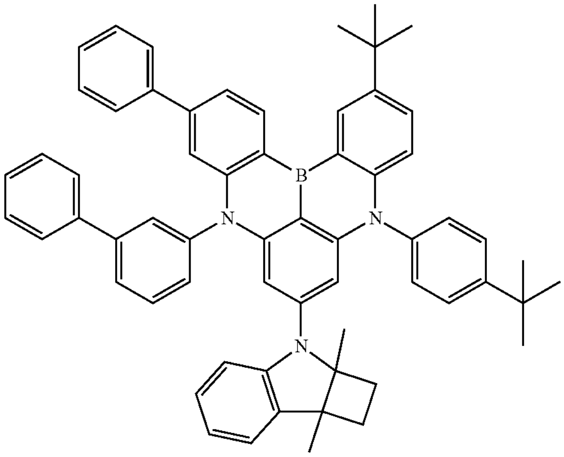
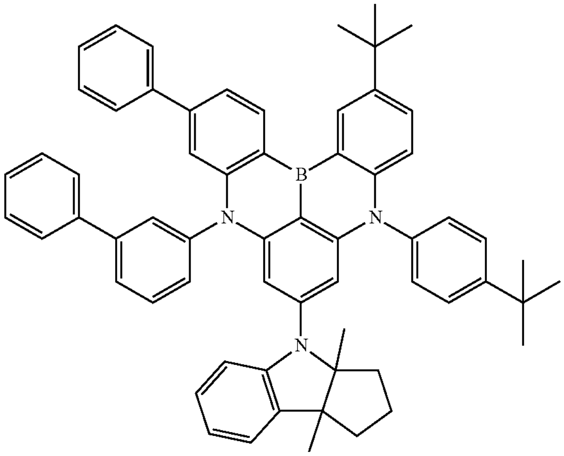
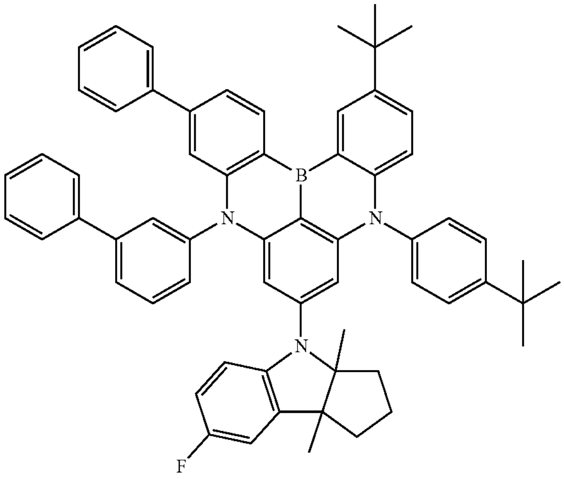
-continued
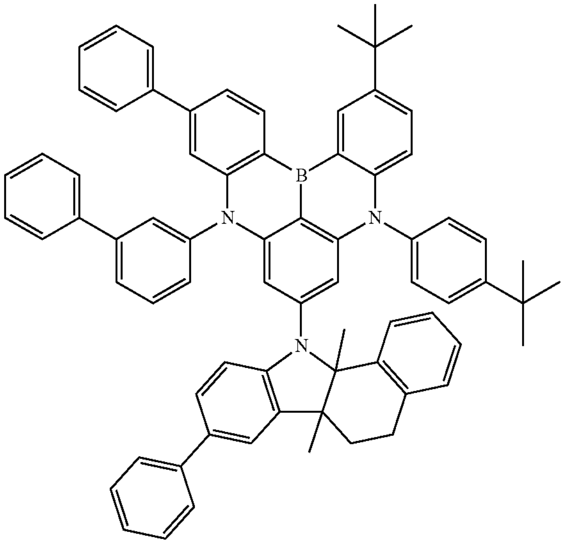
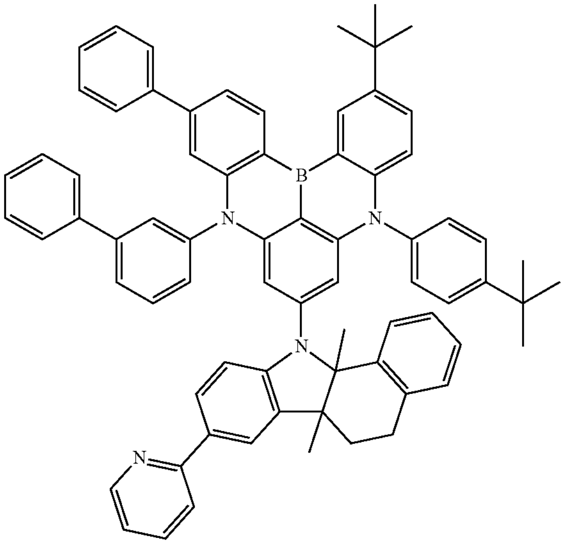
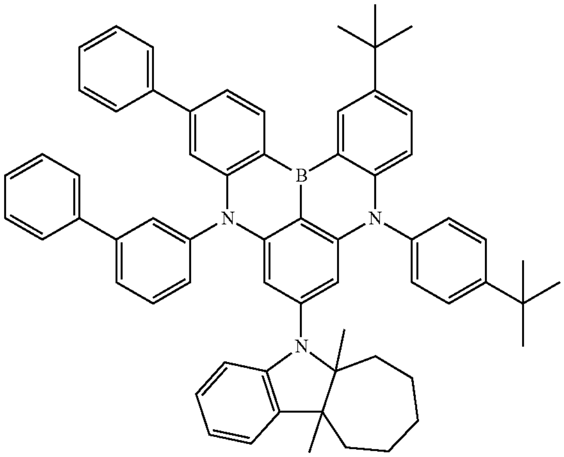

-continued
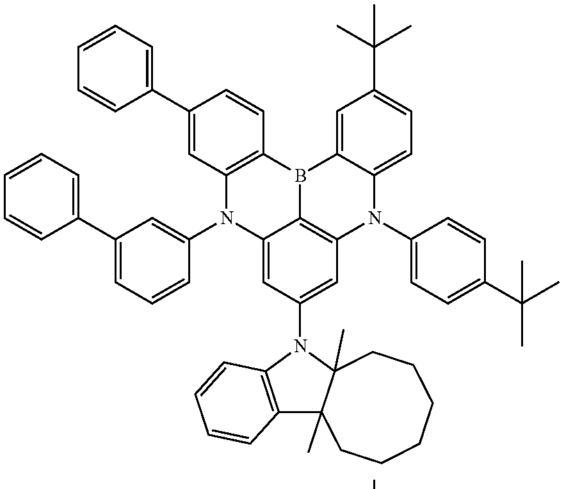
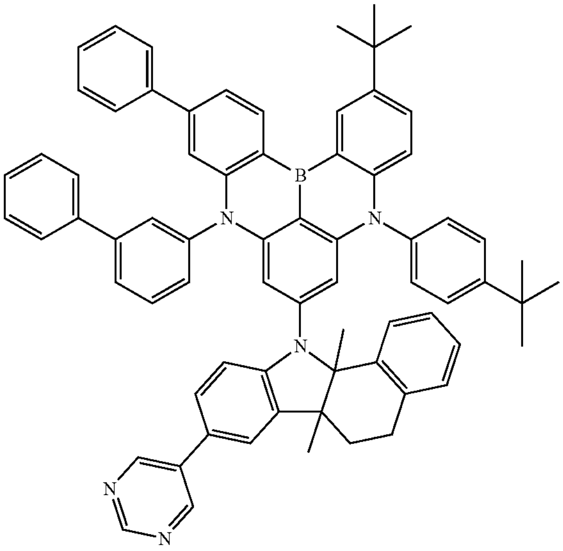
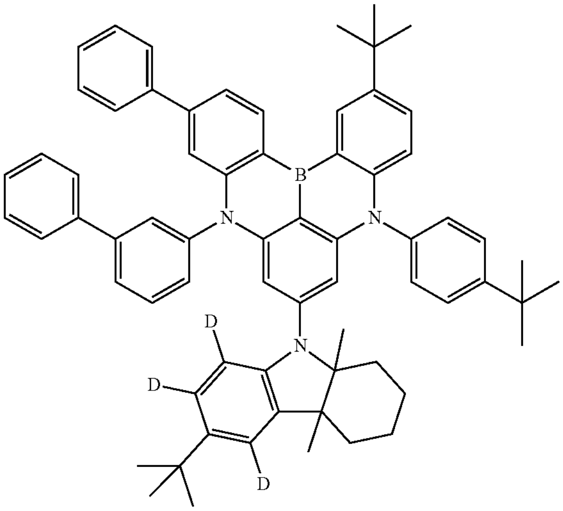
-continued
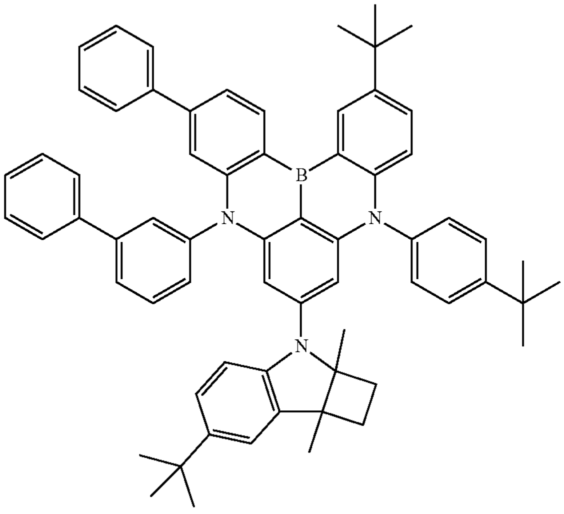
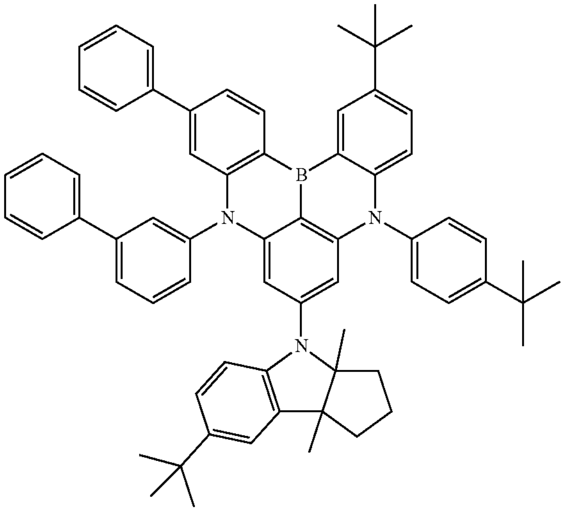
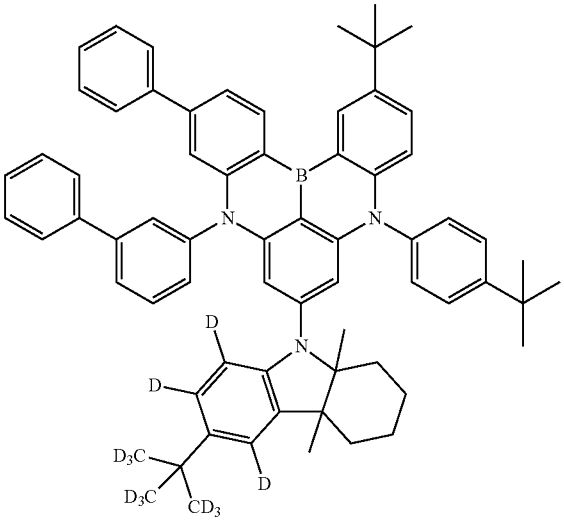

-continued
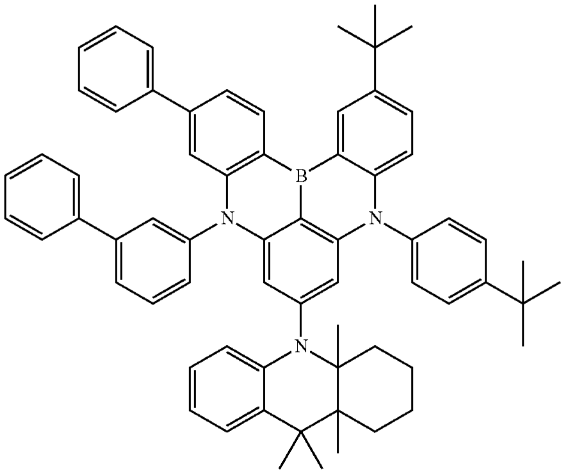
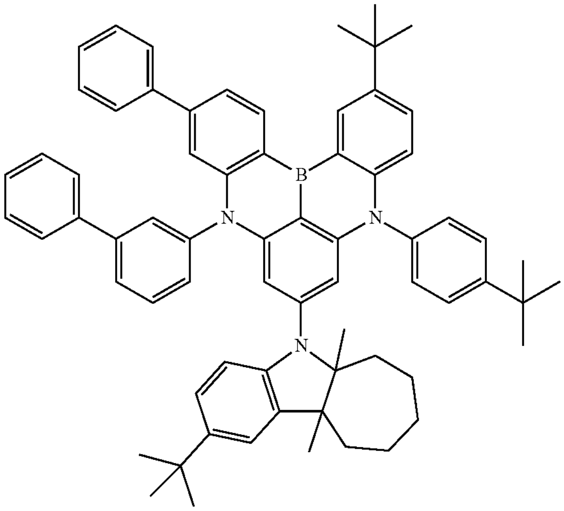
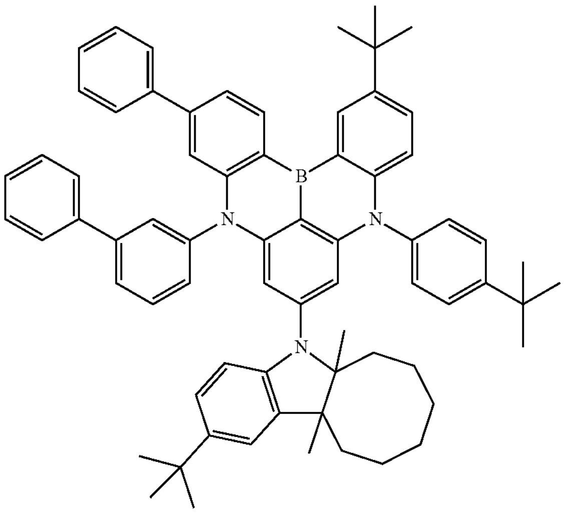
-continued
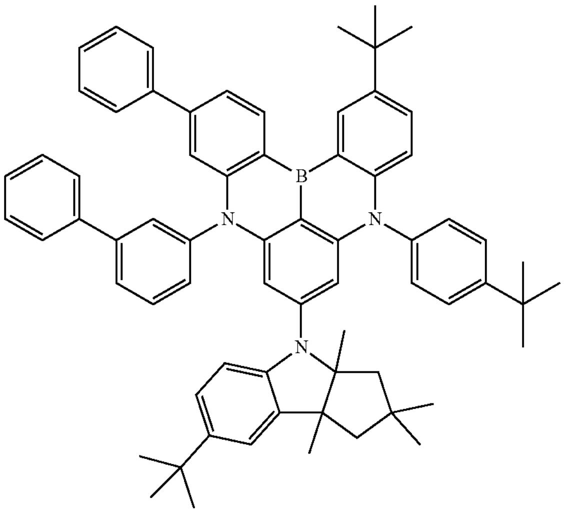
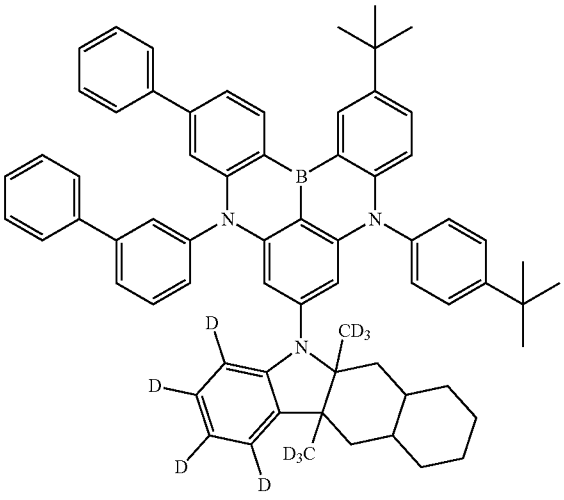
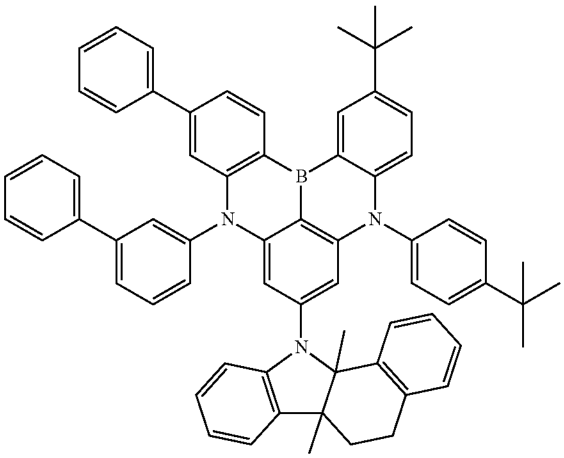

-continued
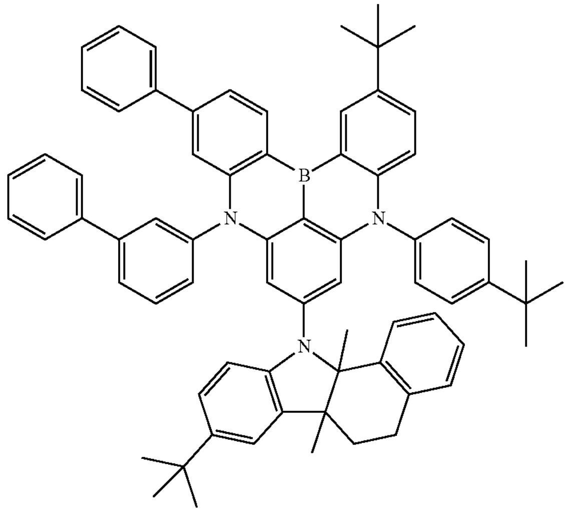 [SMILES: CC(C)(C)c1ccc(N2c3ccc(C(C)(C)C)cc3B3c4ccc(-c5ccccc5)cc4N(c4cccc(-c5ccccc5)c4)c4cc(N5c6ccc(C(C)(C)C)cc6C6(C)CCc7ccccc7C56C)cc2c43)cc1]
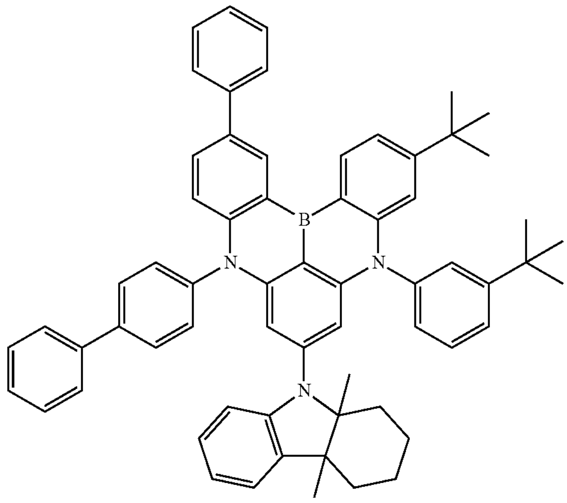
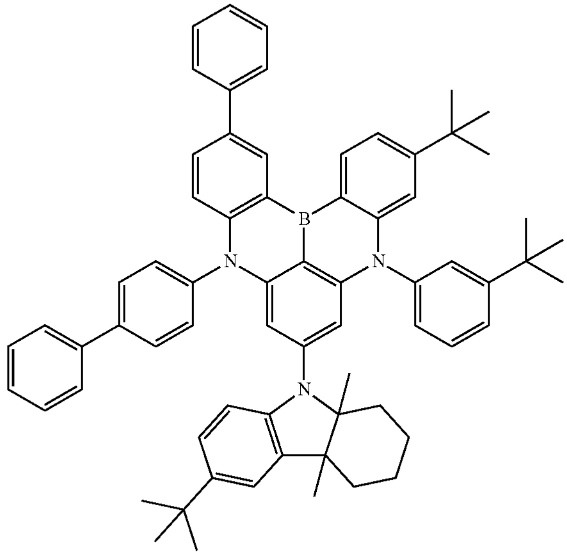
-continued
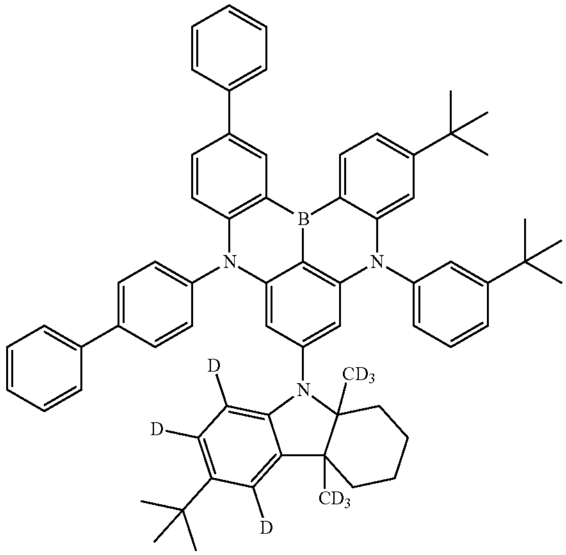
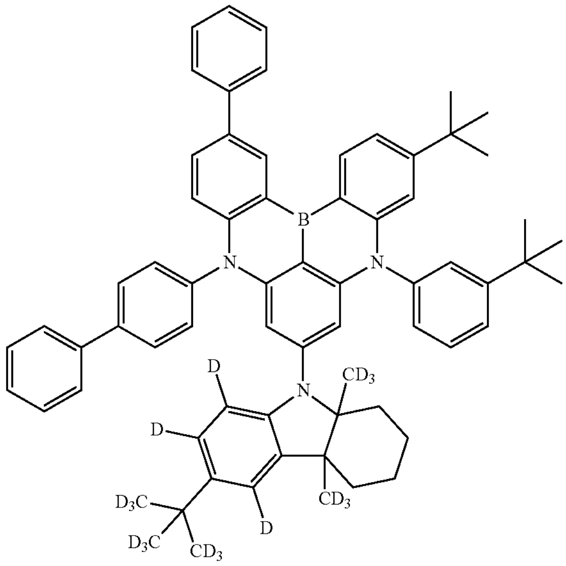
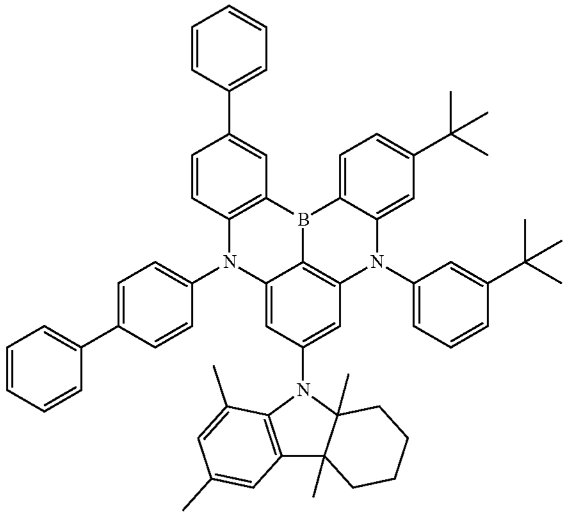

-continued
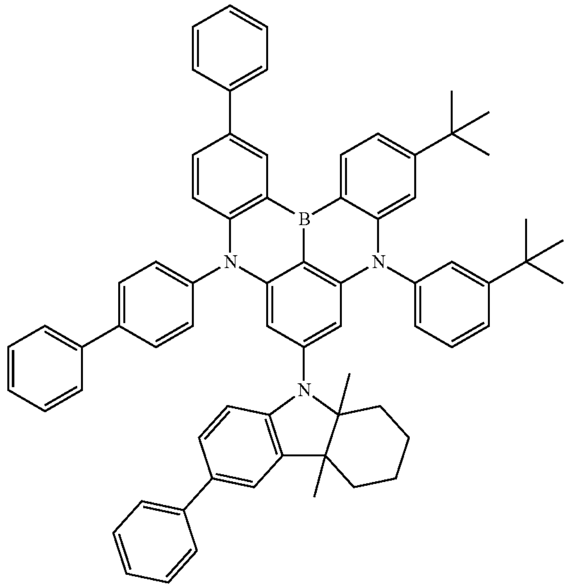
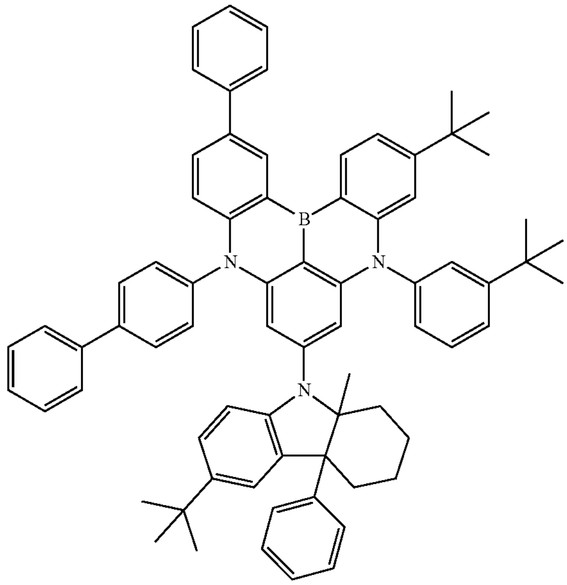
-continued
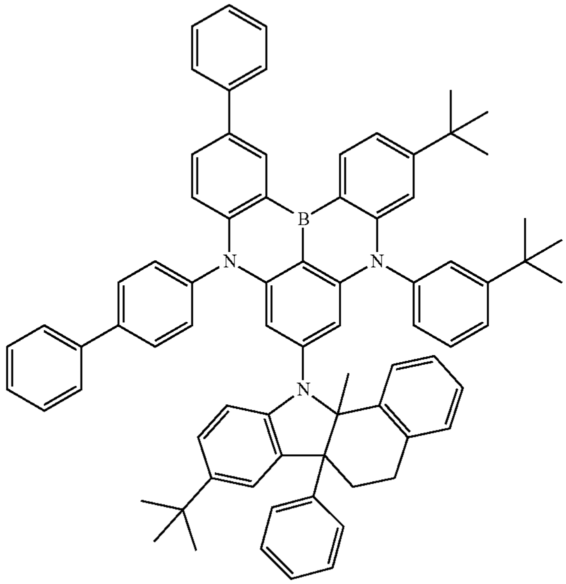
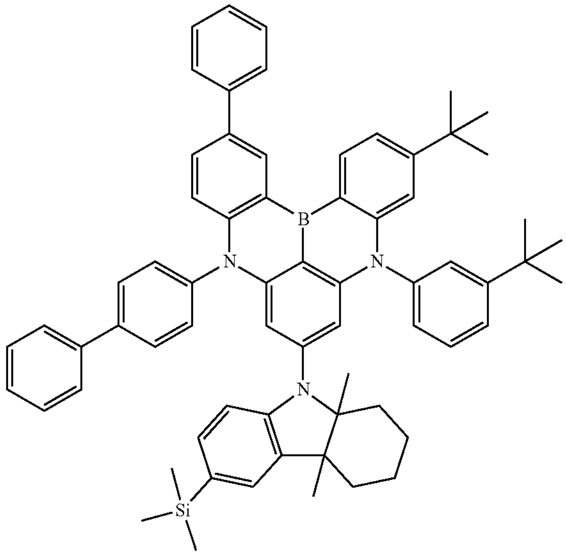

-continued
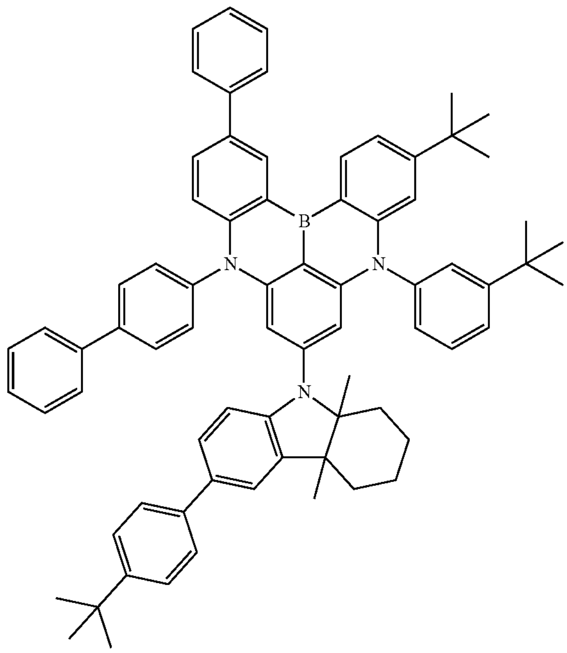
-continued
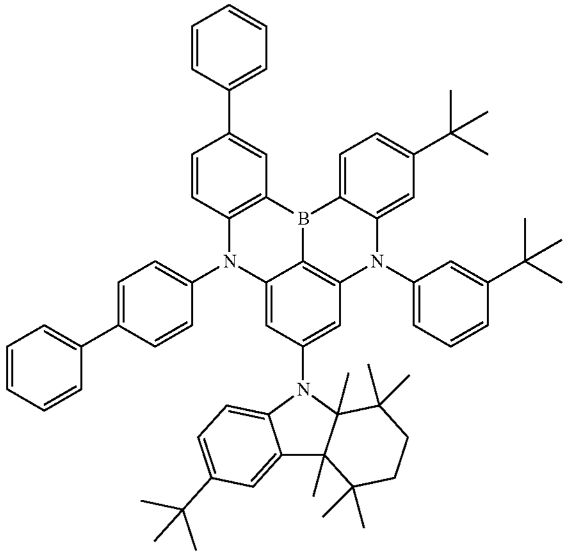
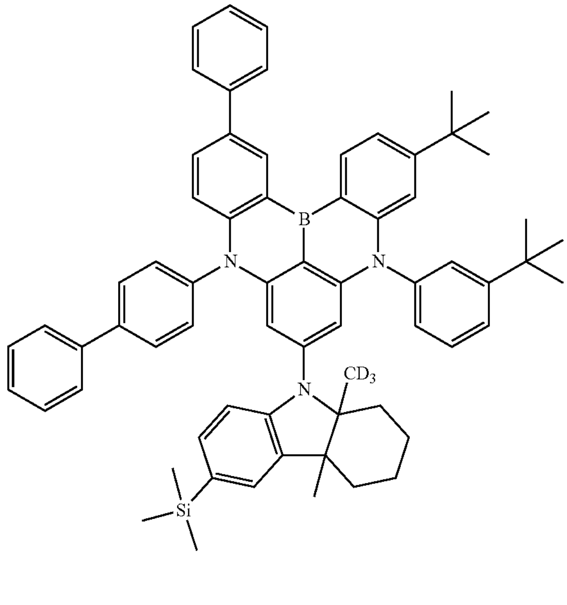
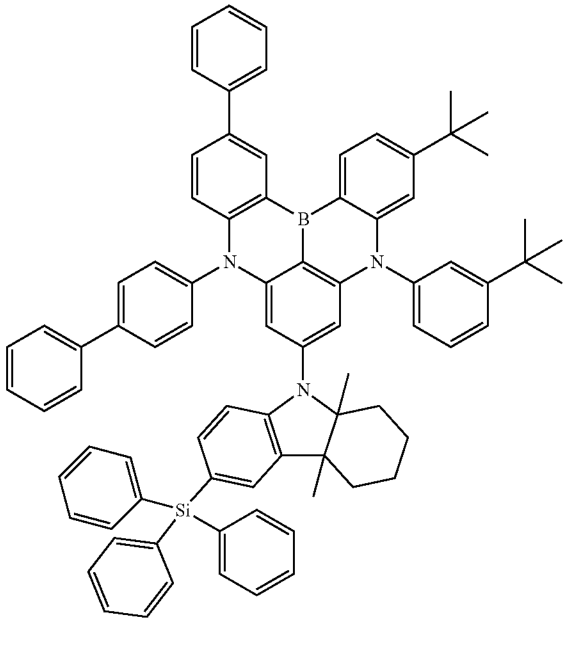

-continued
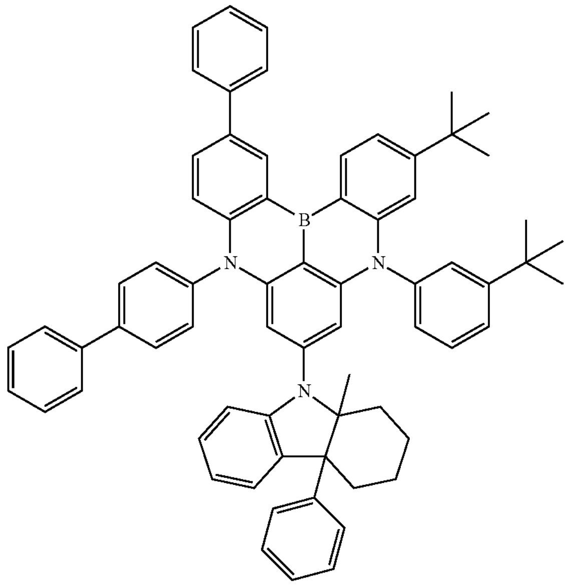
-continued
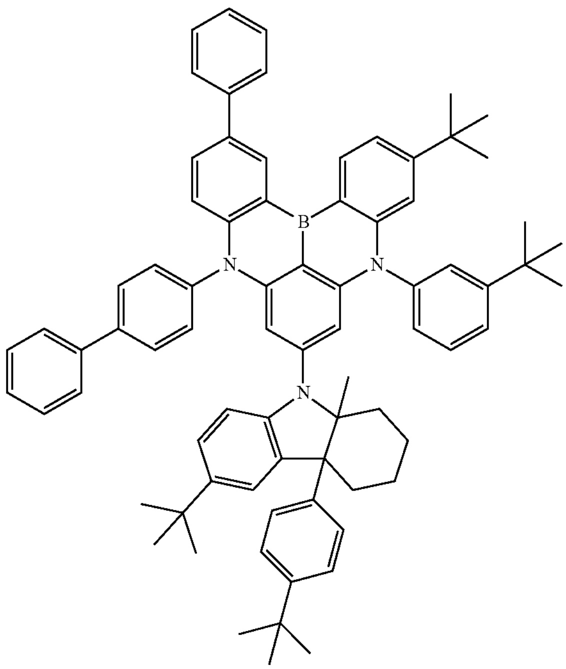
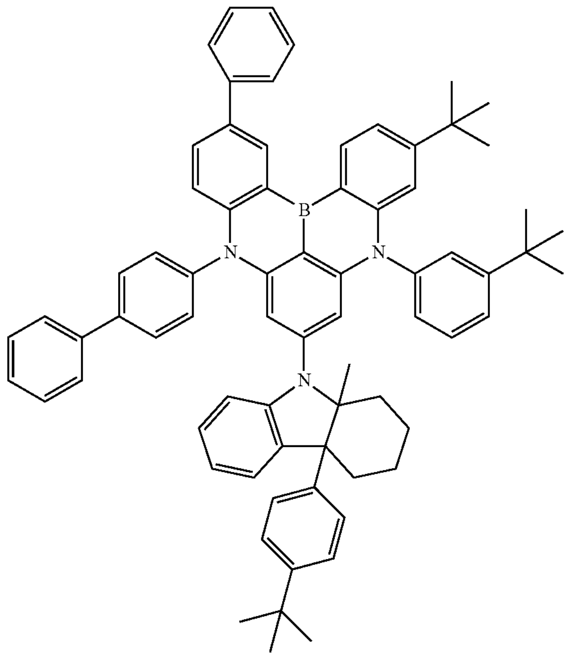
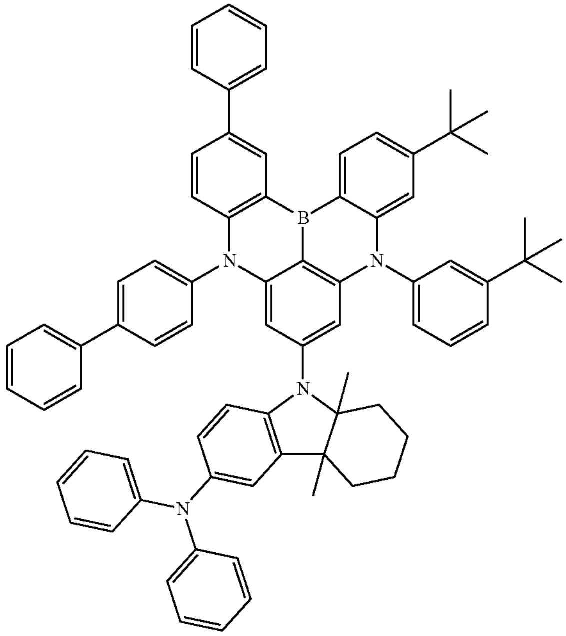

-continued
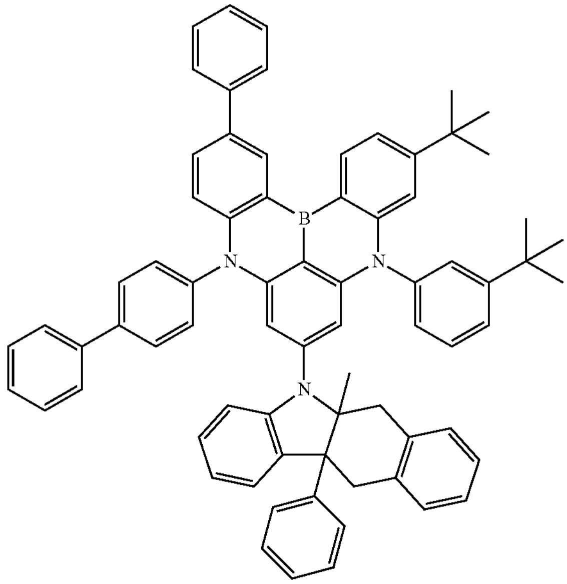
-continued
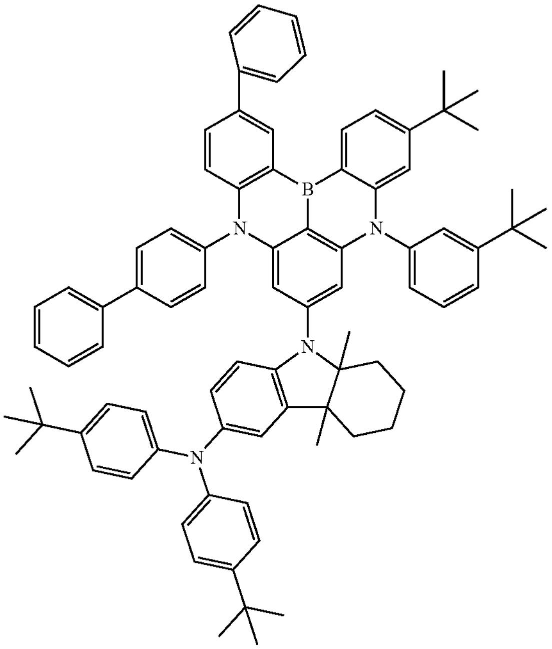
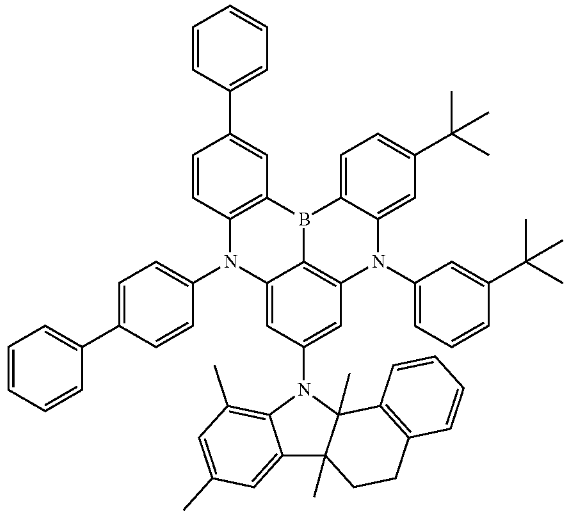
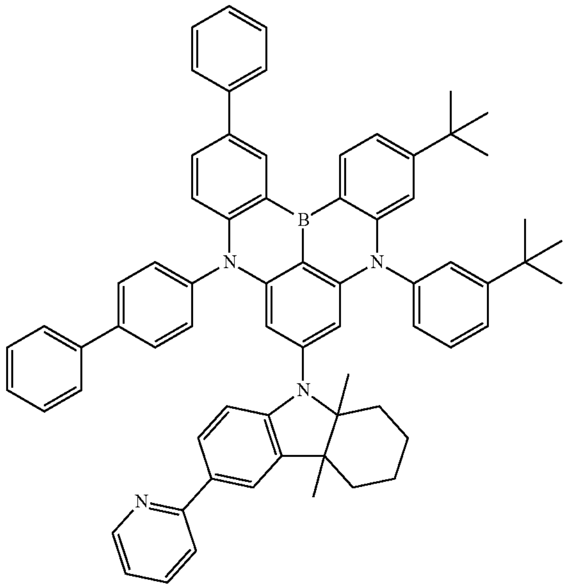

-continued
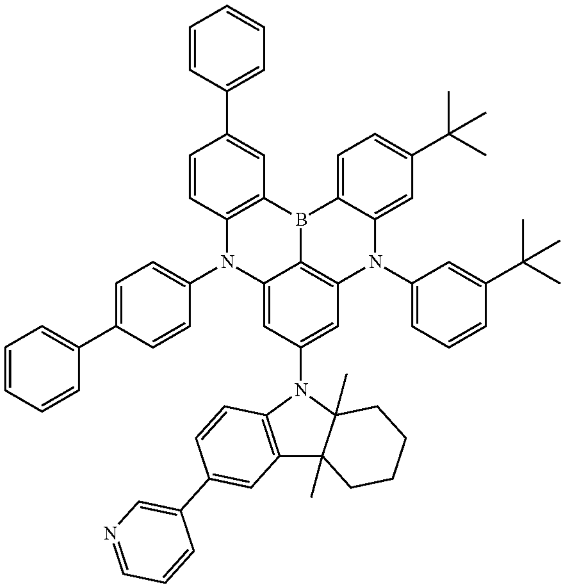
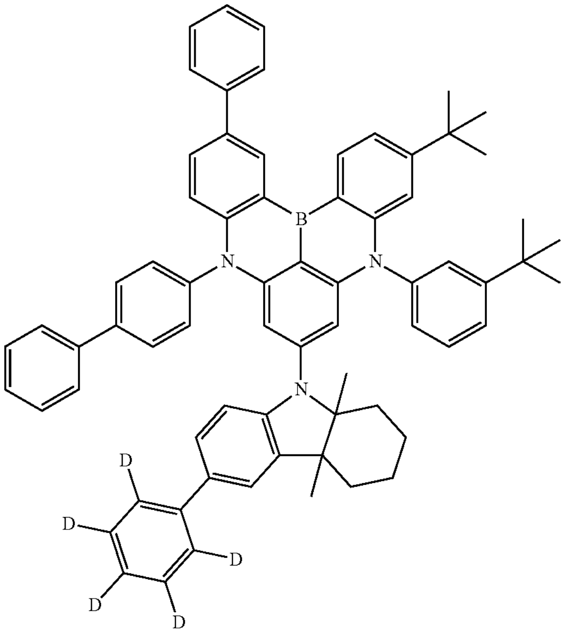
-continued
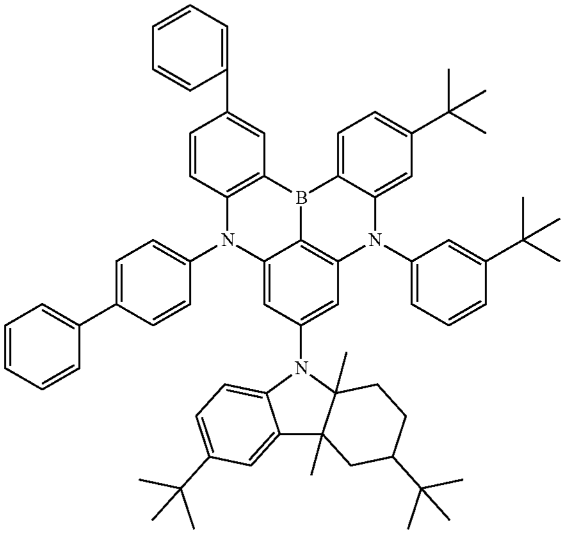
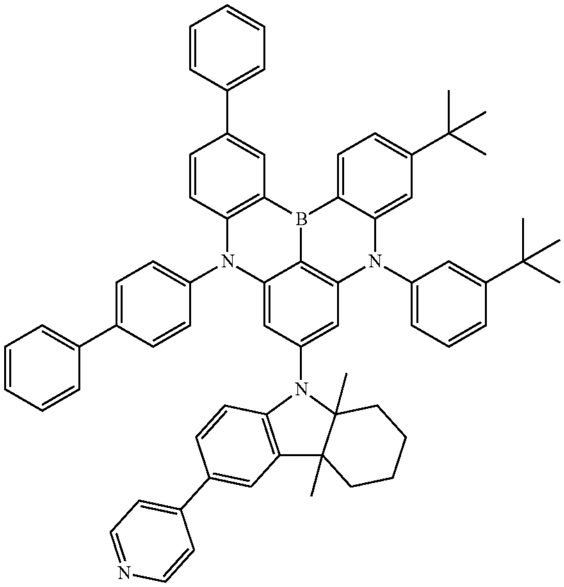
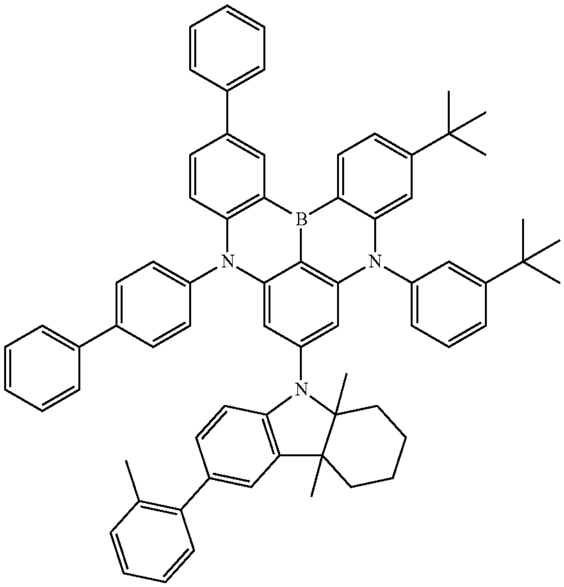

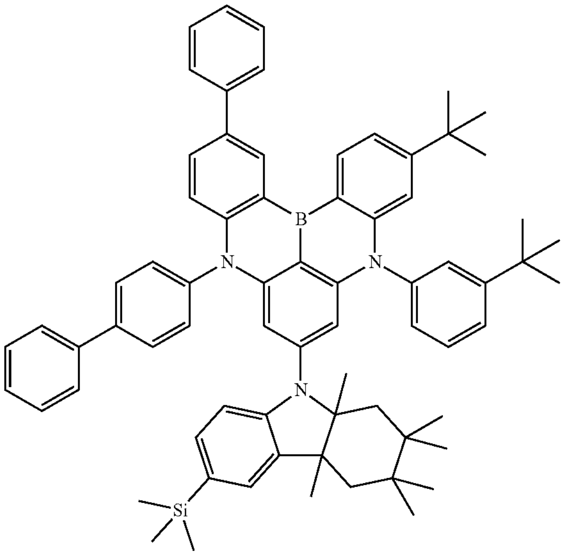
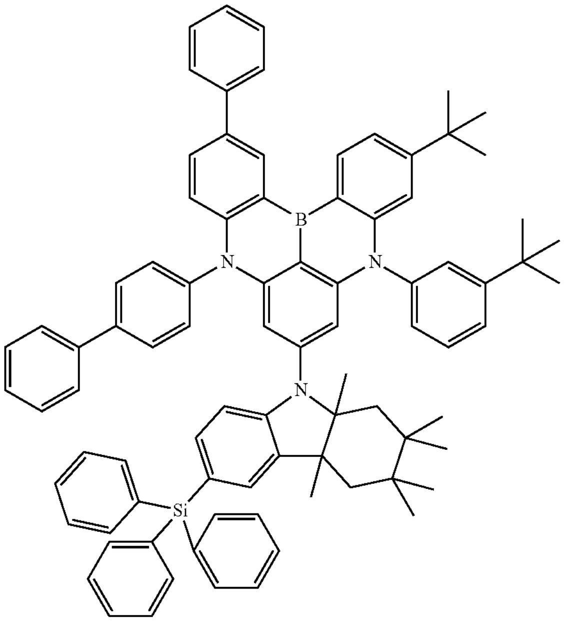
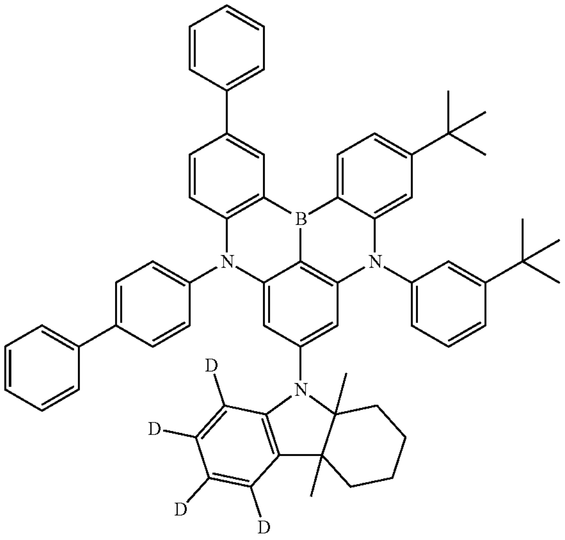
-continued
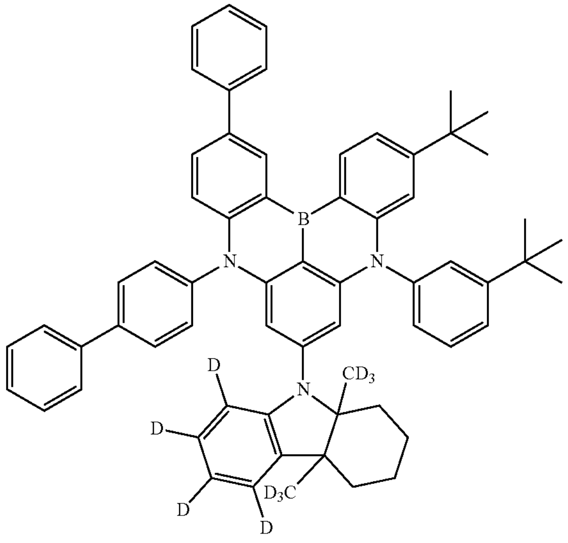
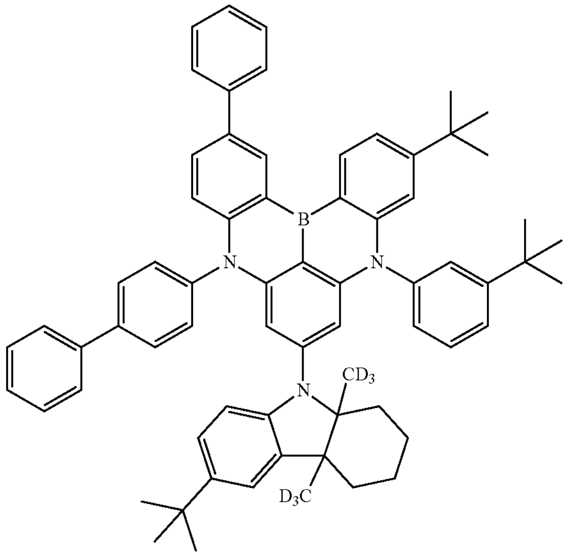
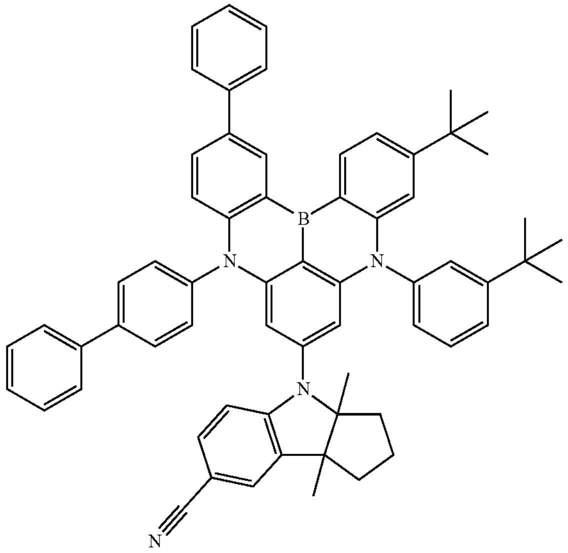

-continued
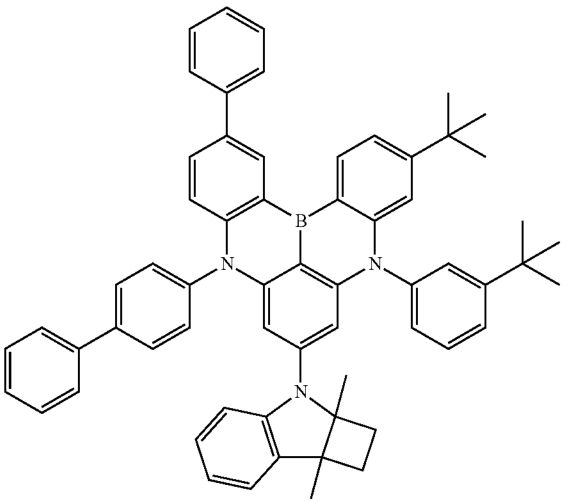
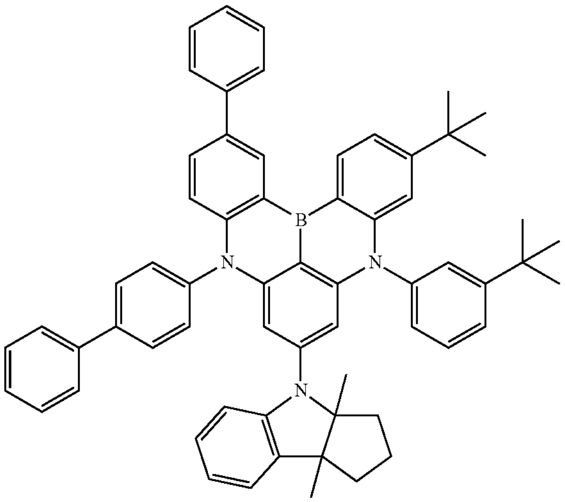
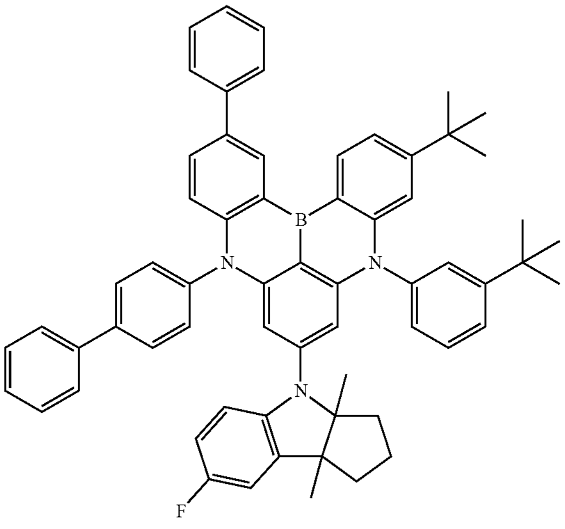
-continued
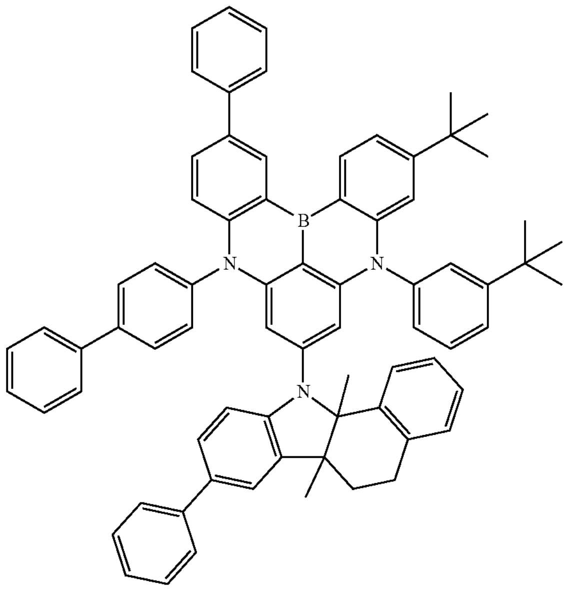
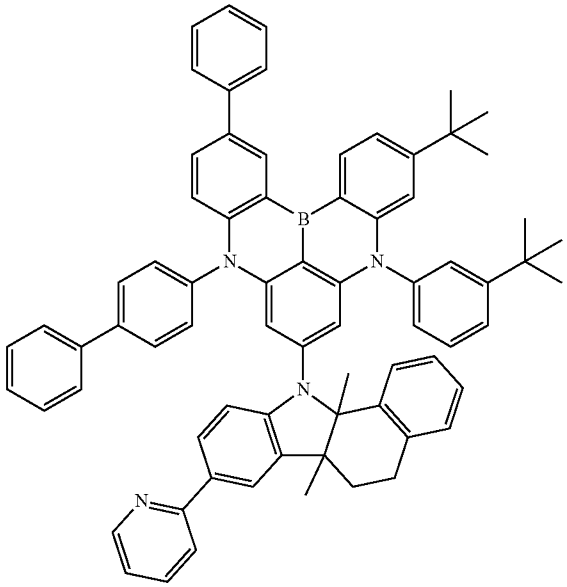
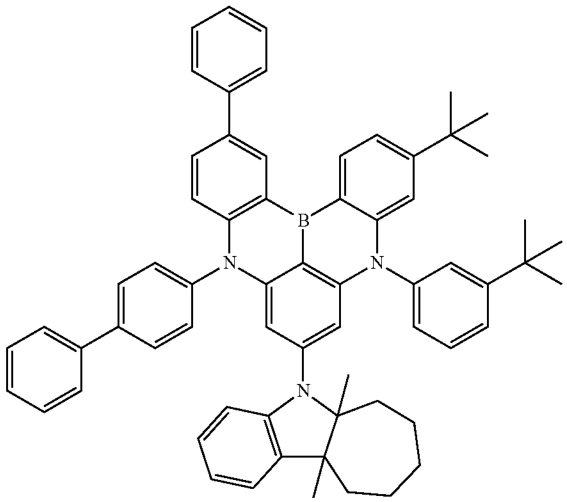

-continued
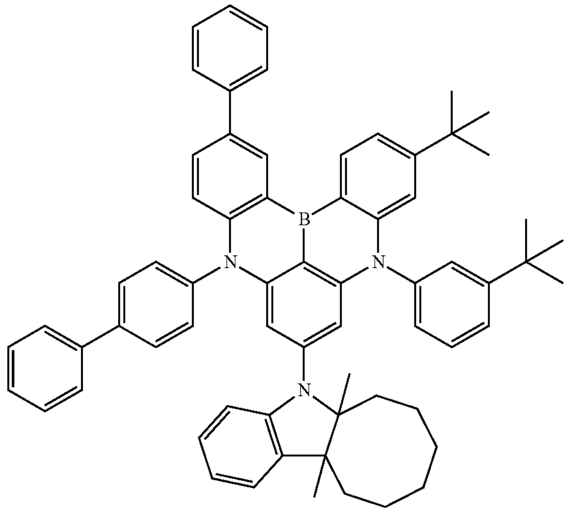
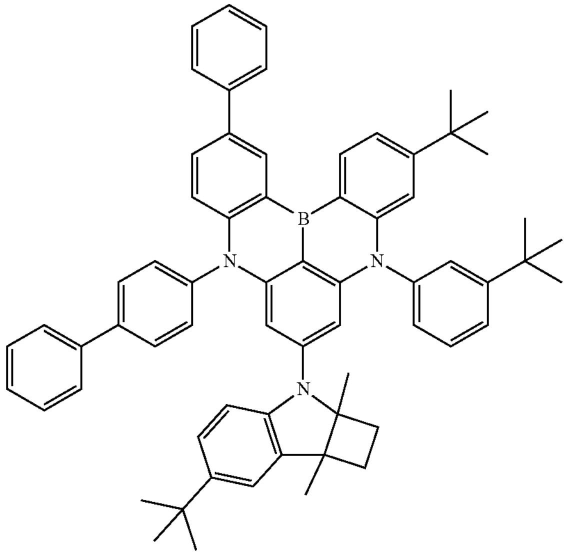
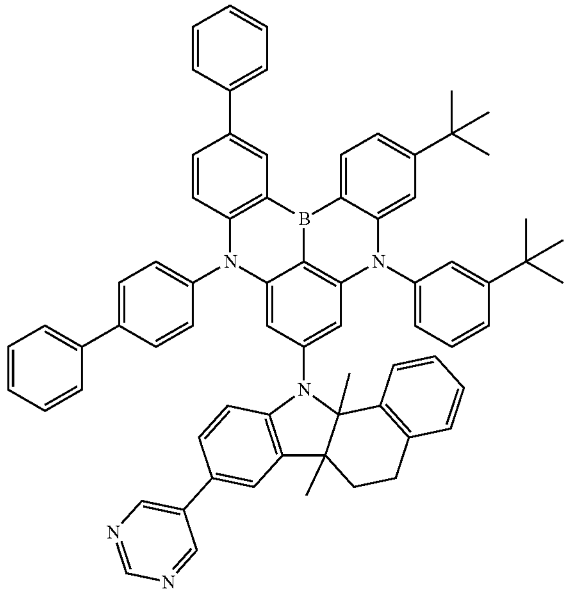
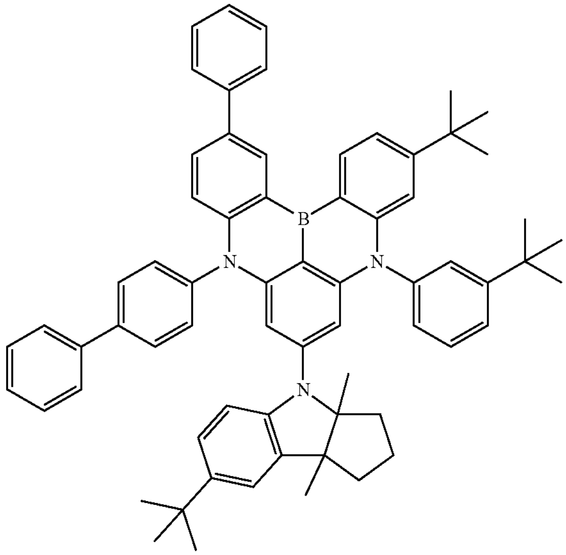
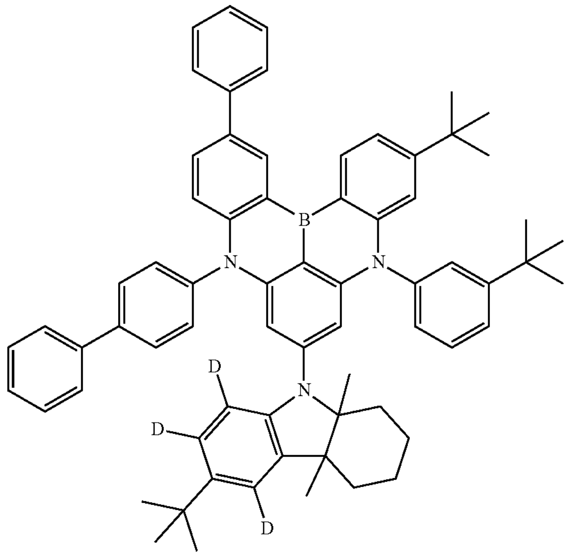
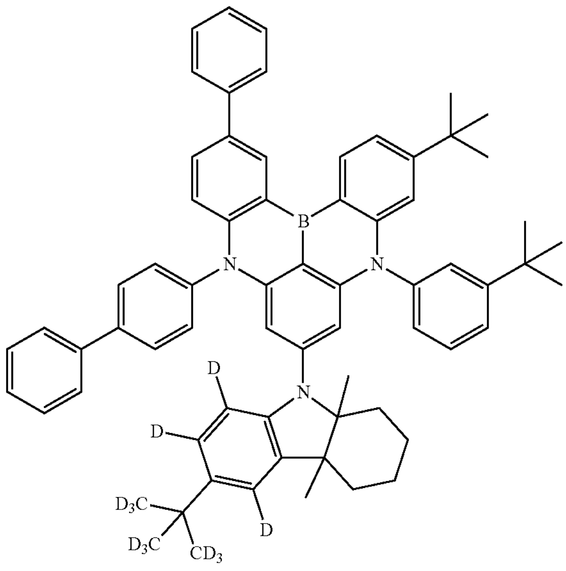
-continued -continued
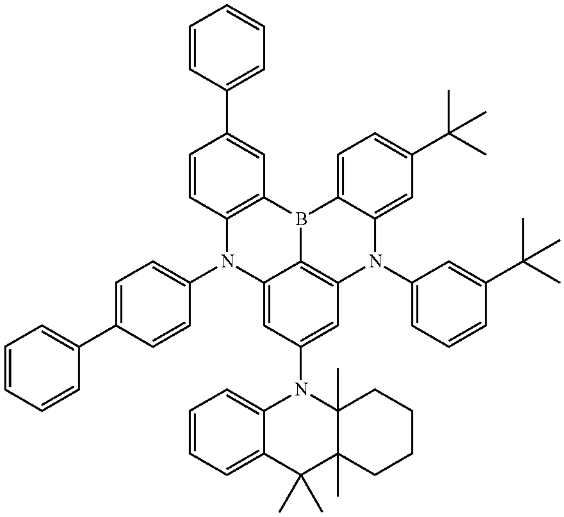
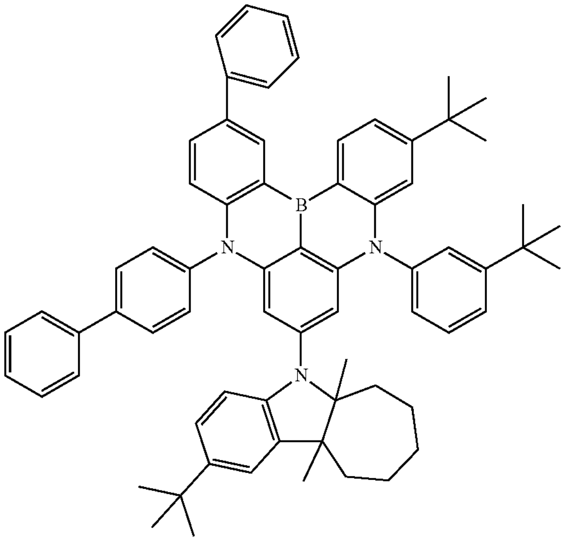
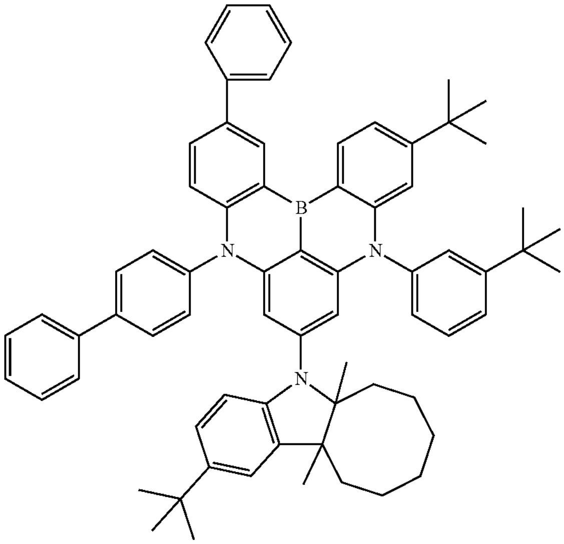
-continued
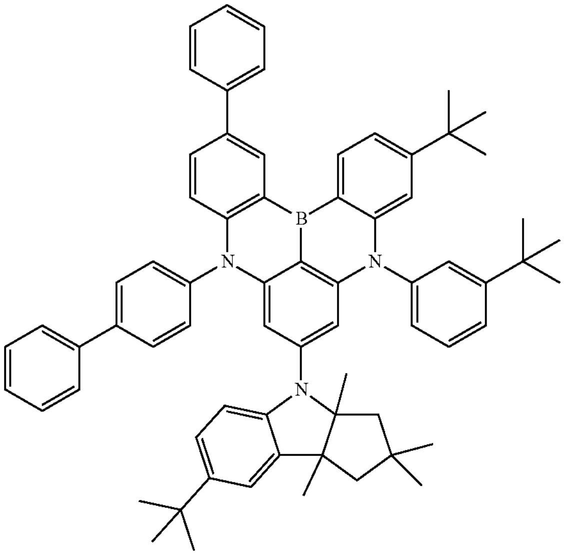
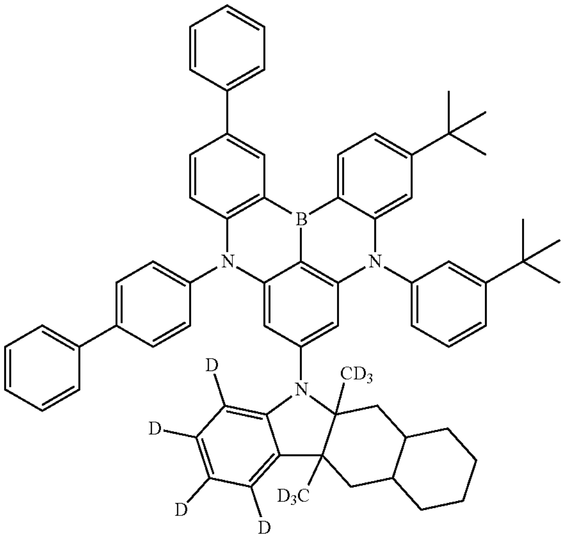
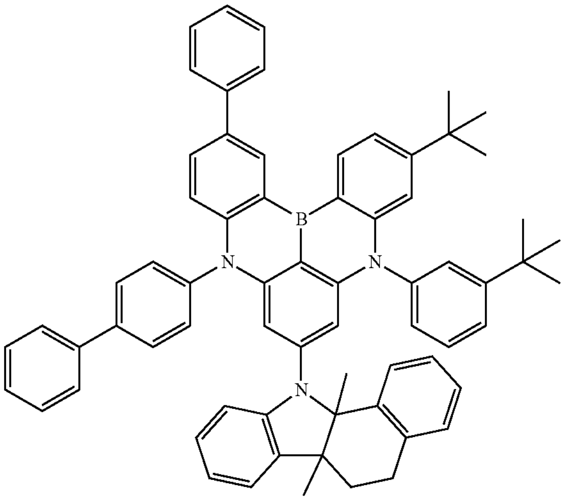

-continued
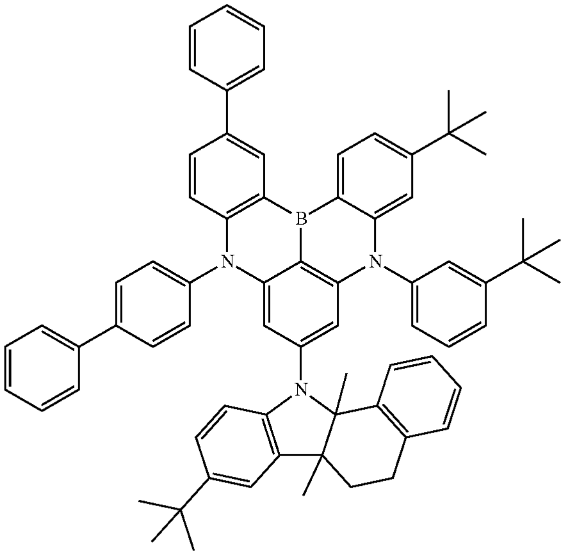
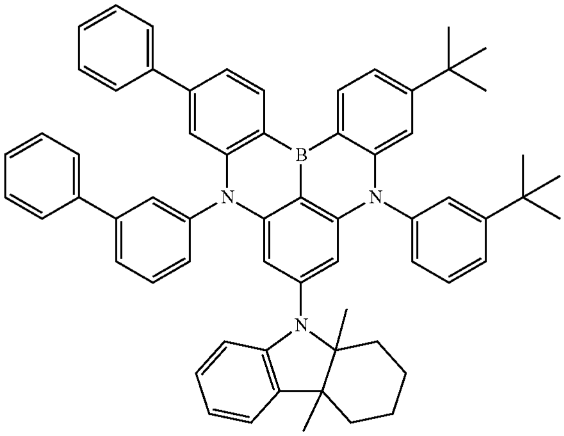
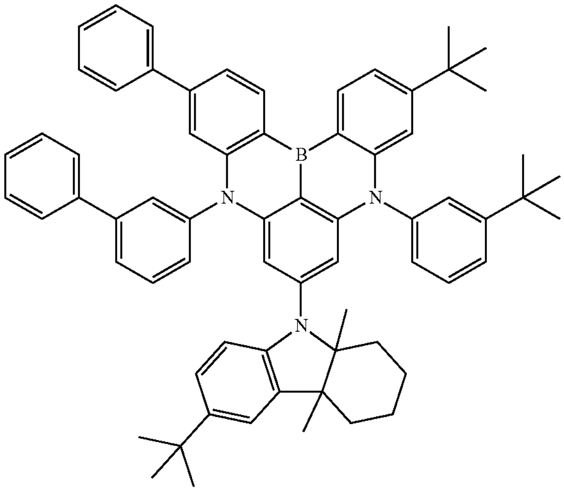
-continued
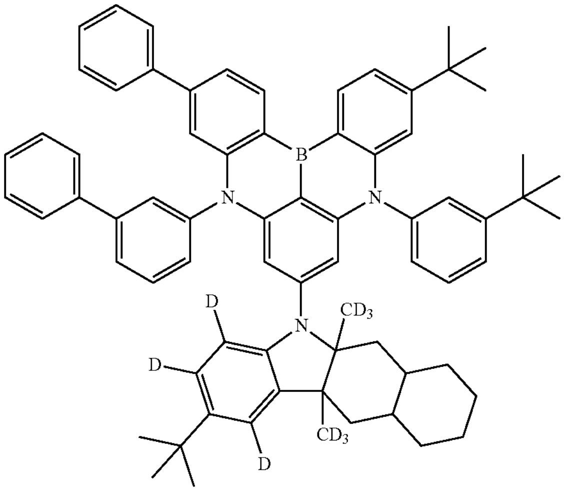
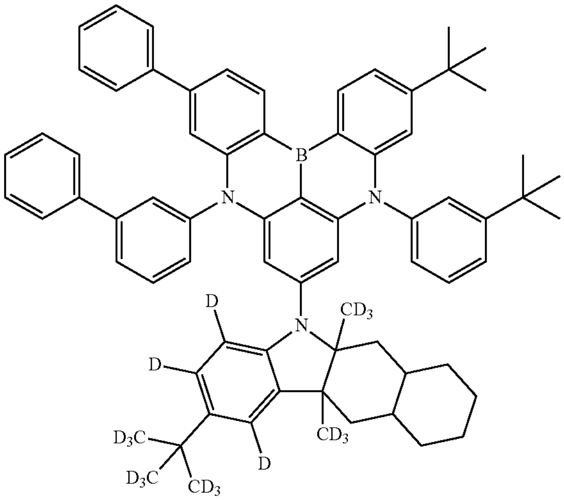
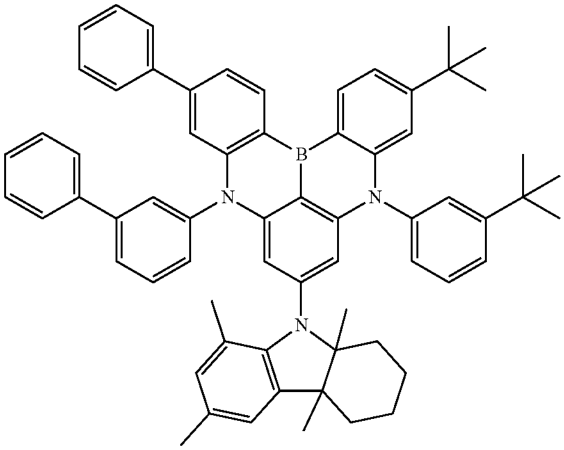

-continued
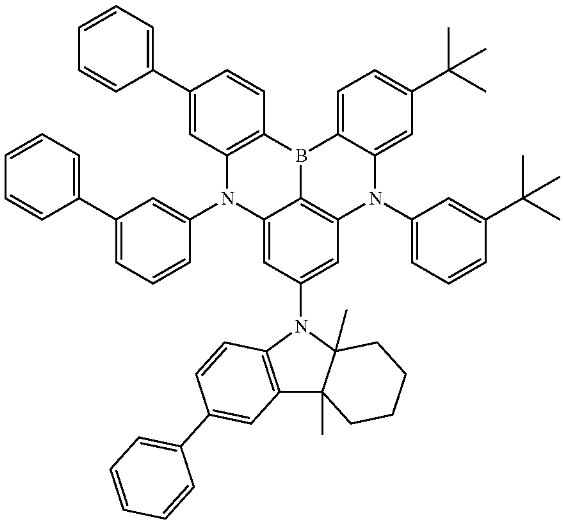
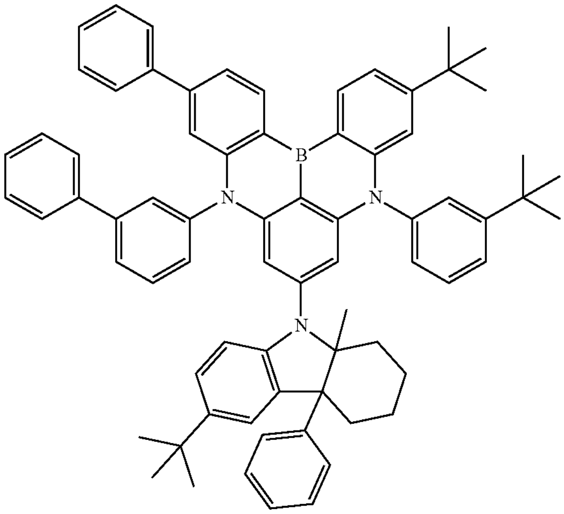
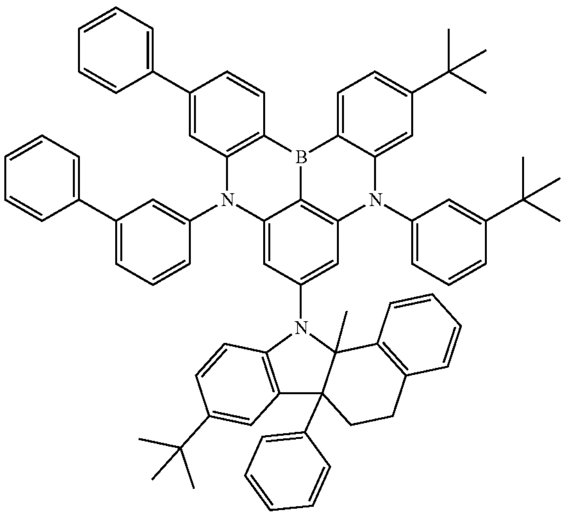
-continued
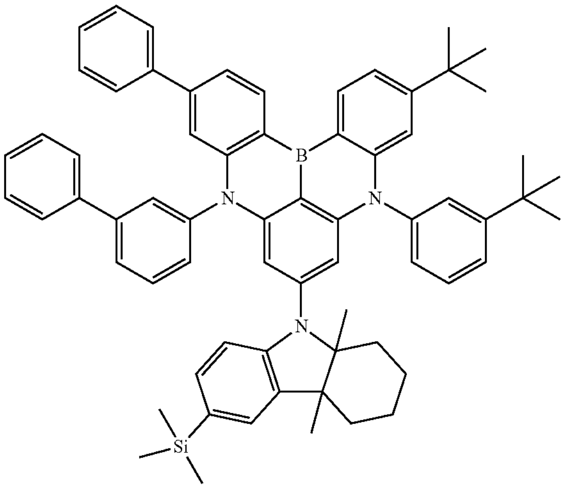
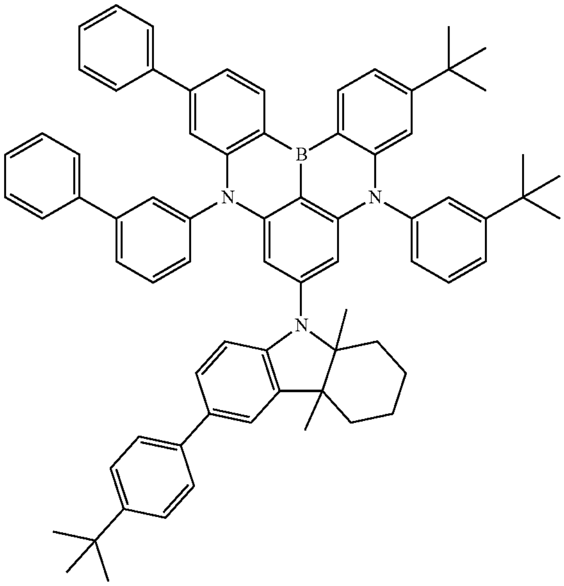
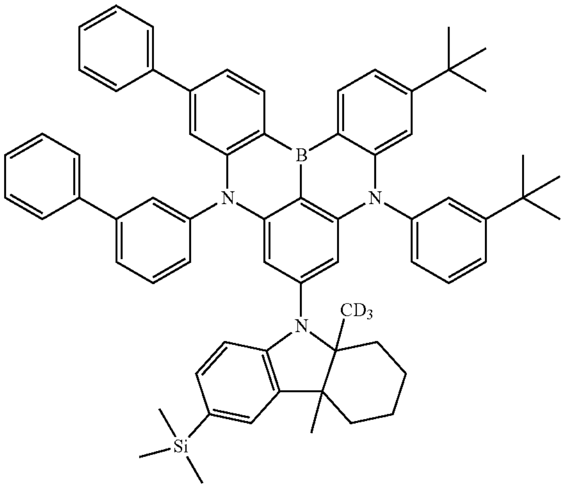

-continued
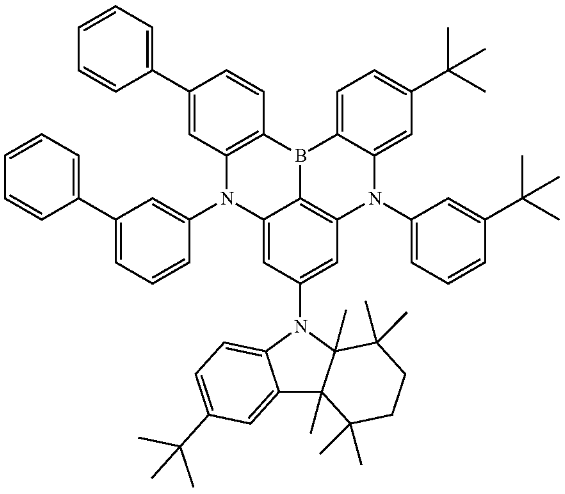
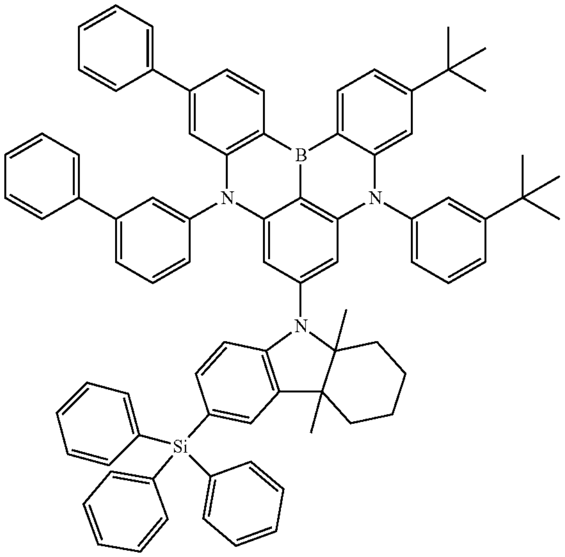
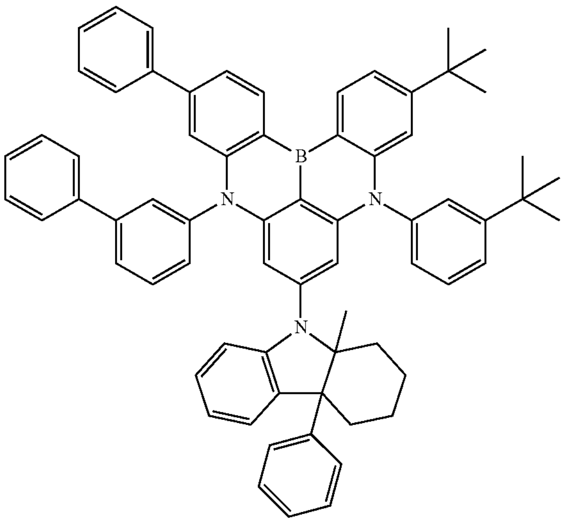
-continued
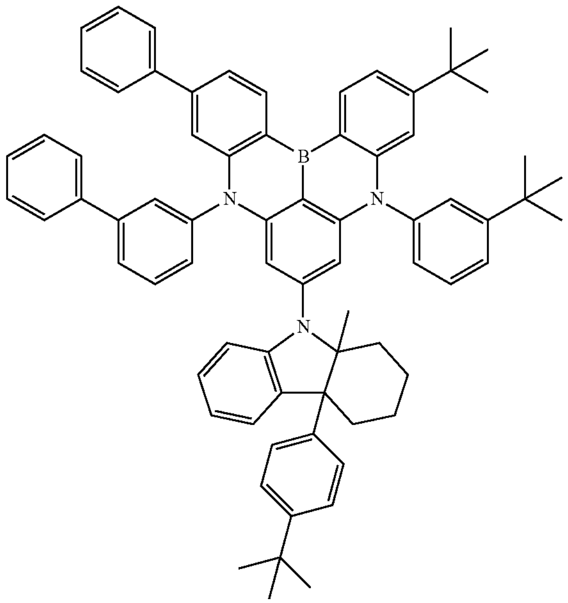
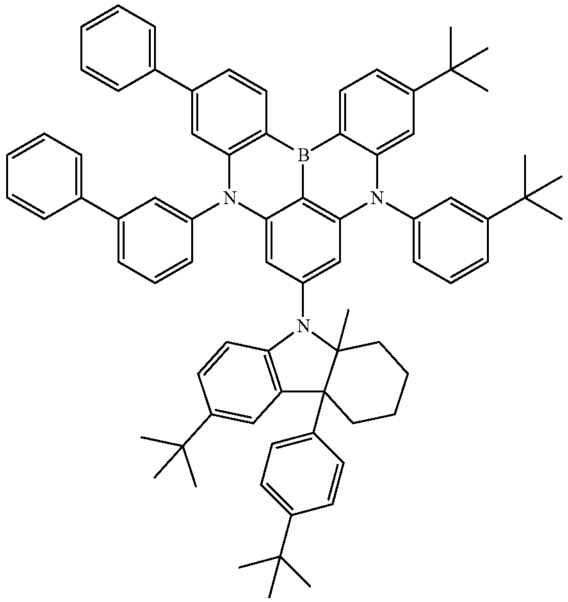

-continued
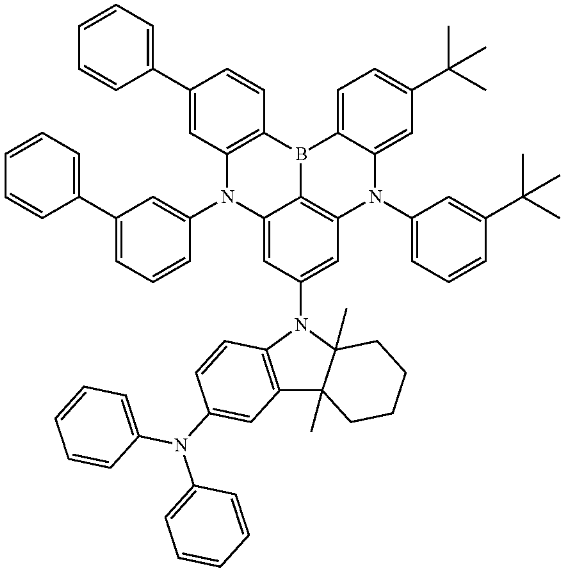
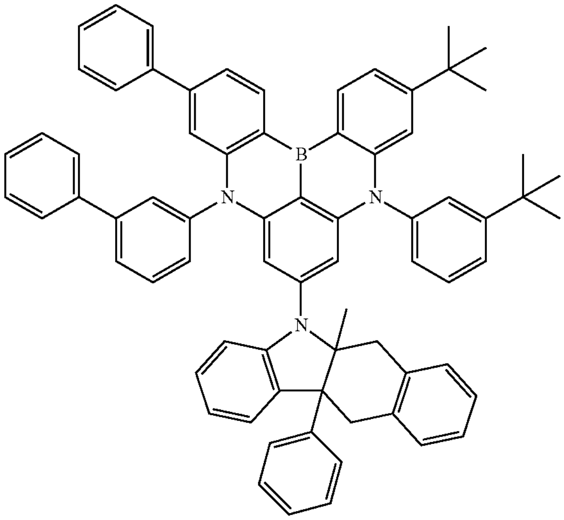
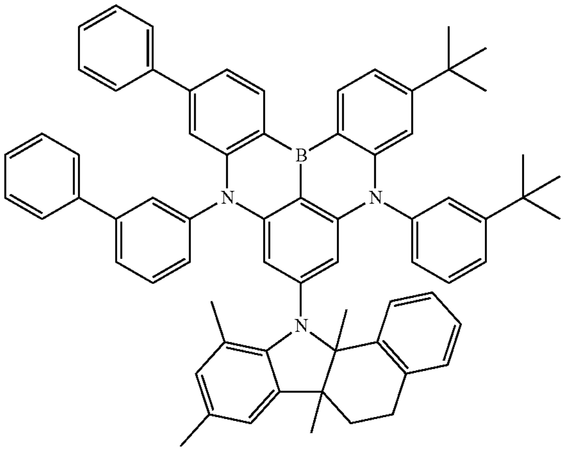
-continued
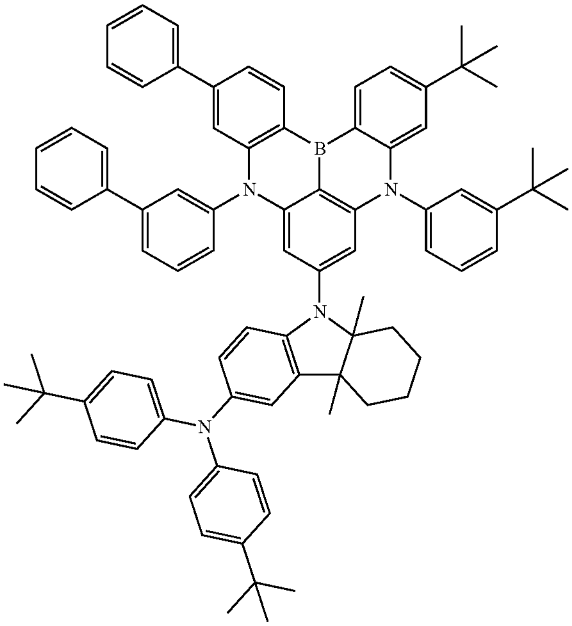
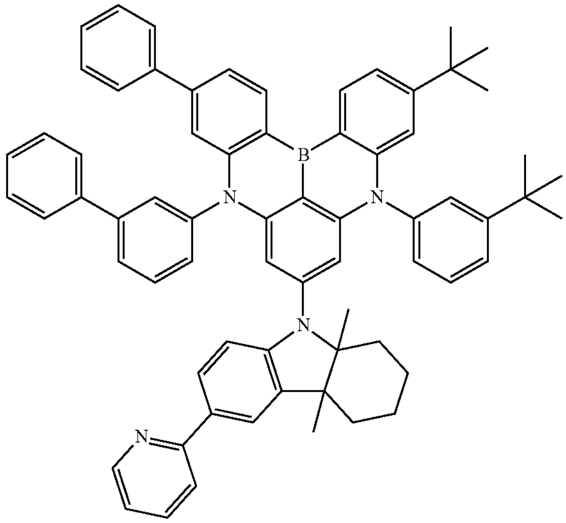
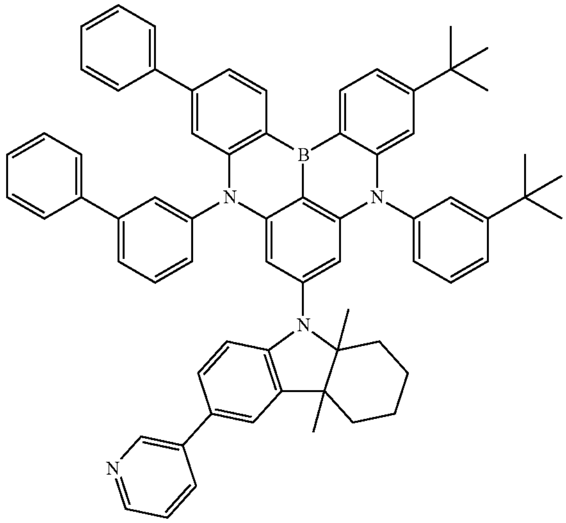

-continued
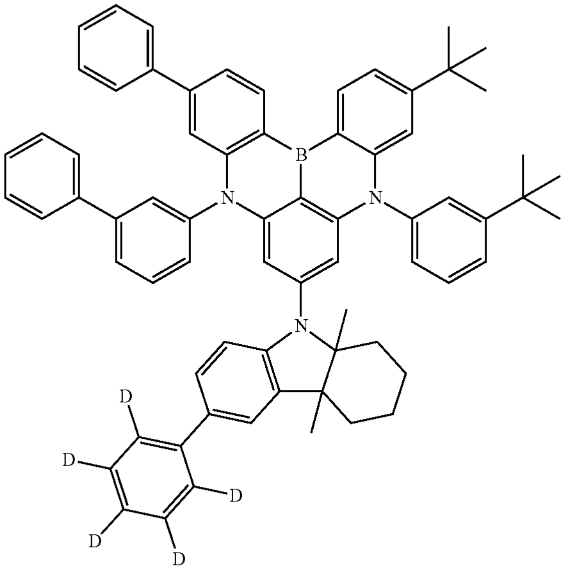
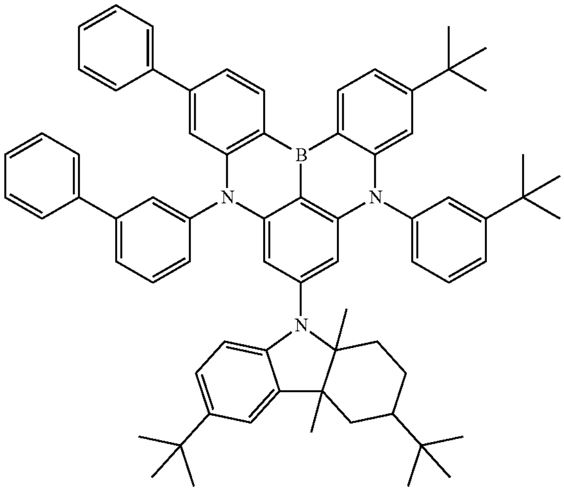
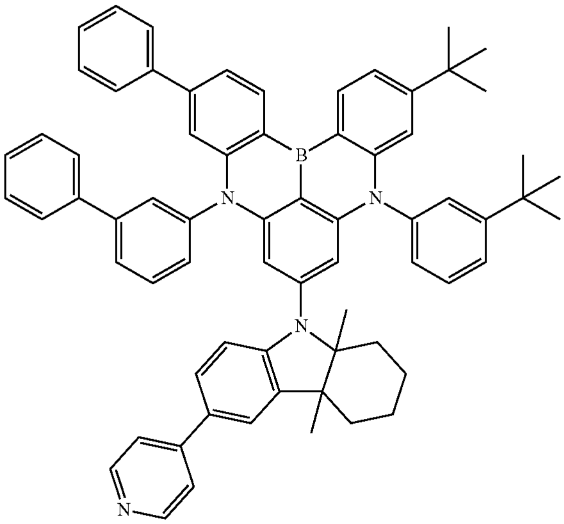
-continued
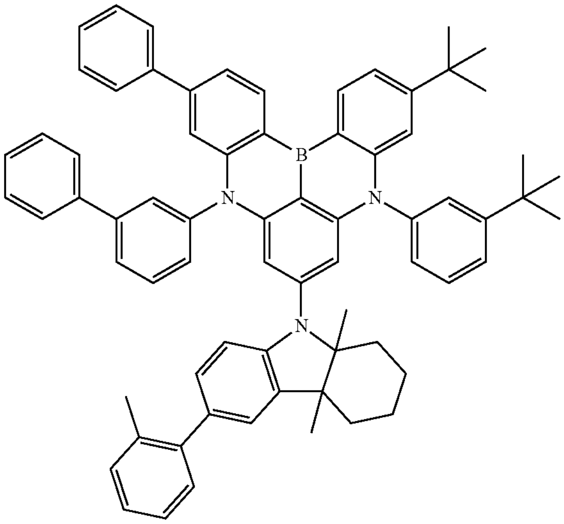
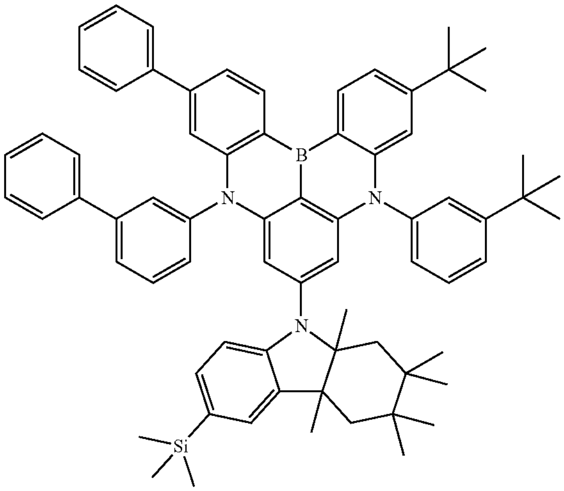
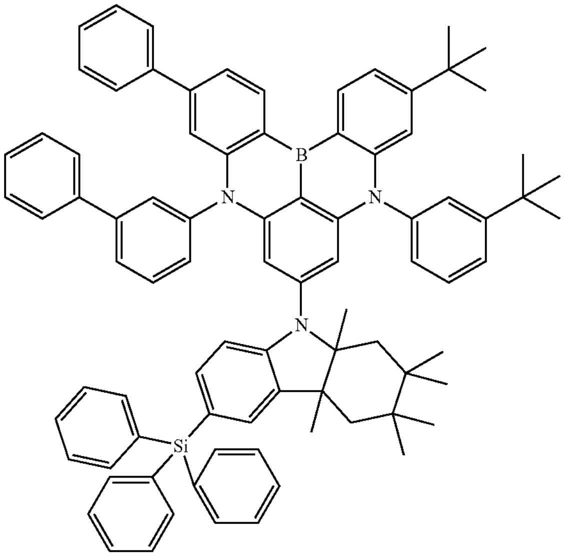

-continued
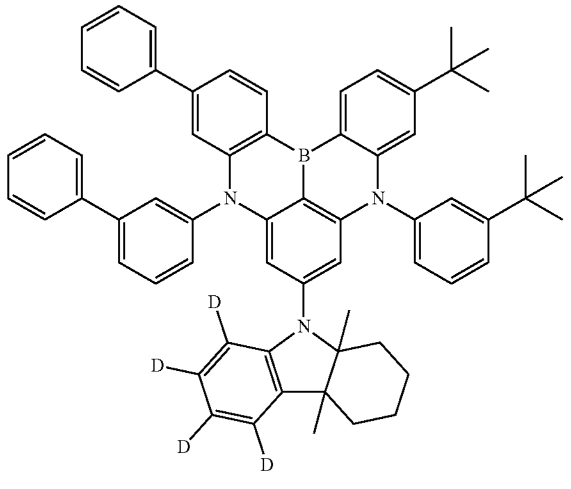
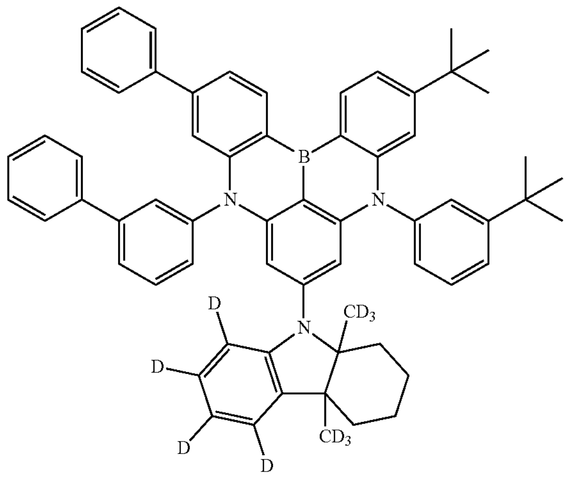
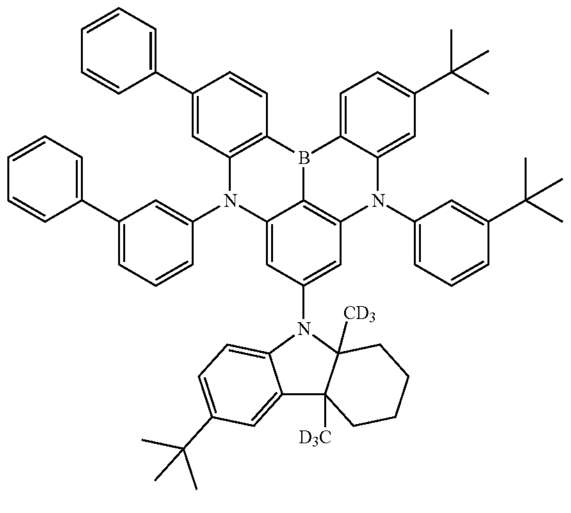
-continued
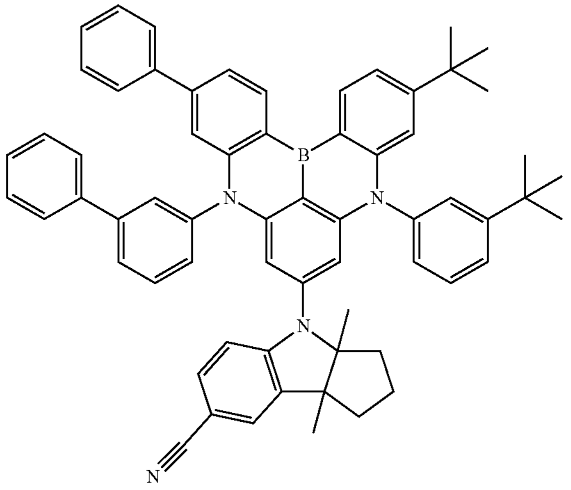
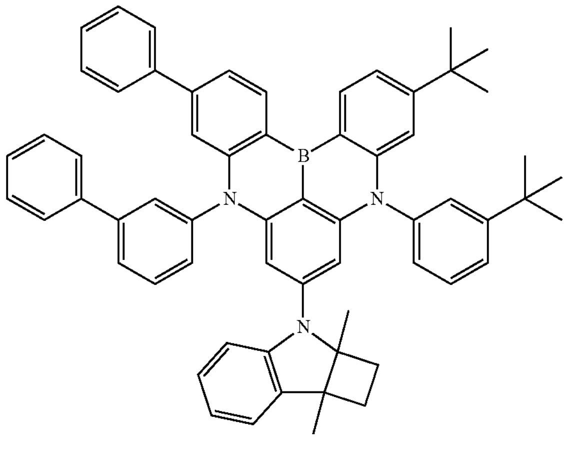
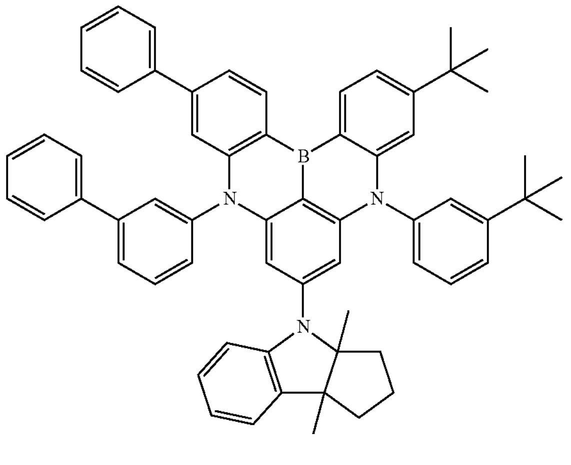

-continued
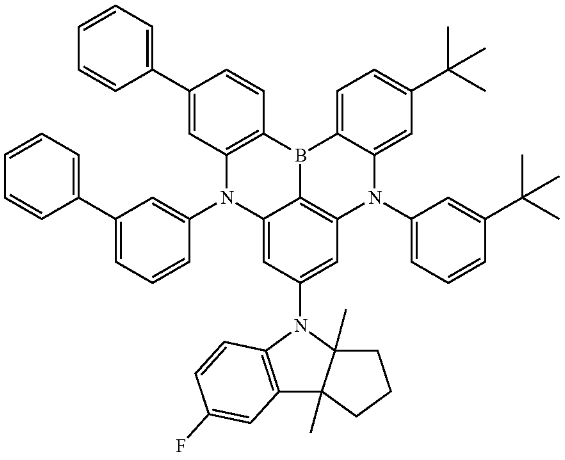
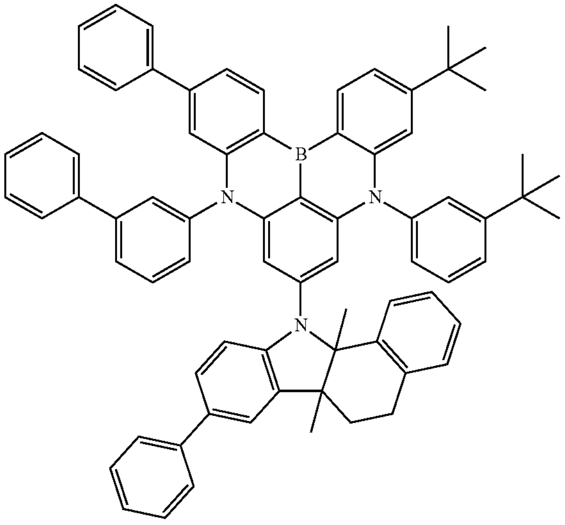
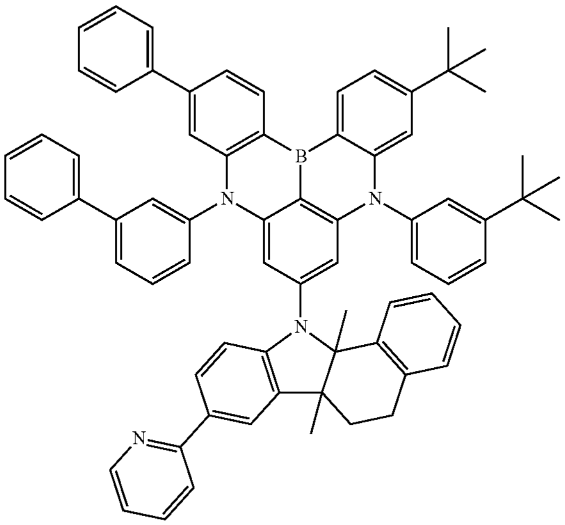
-continued
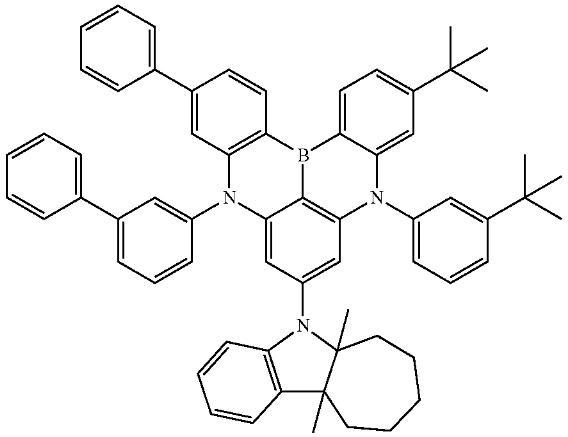
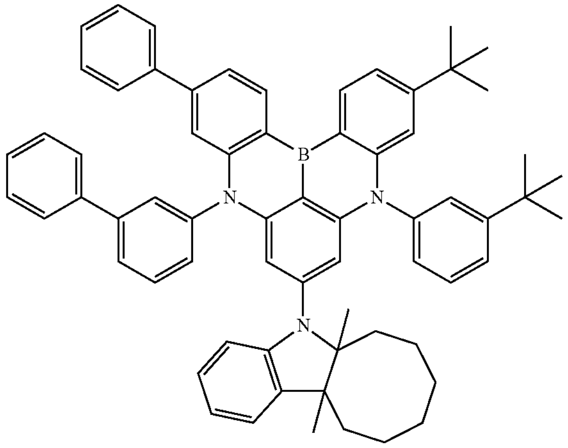
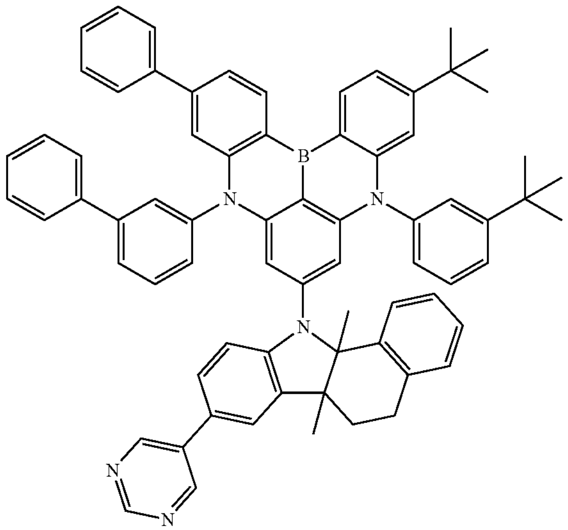

-continued
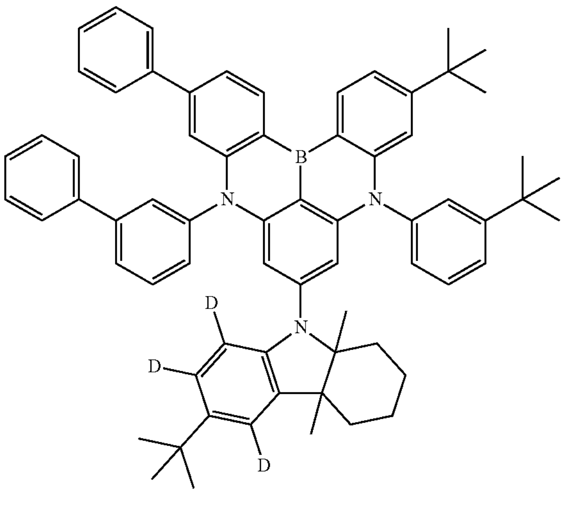
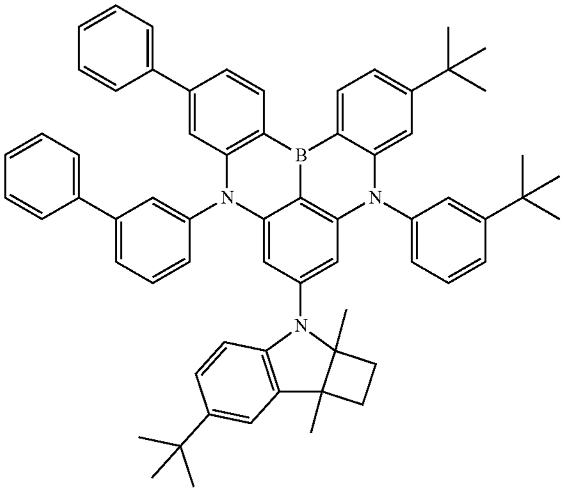
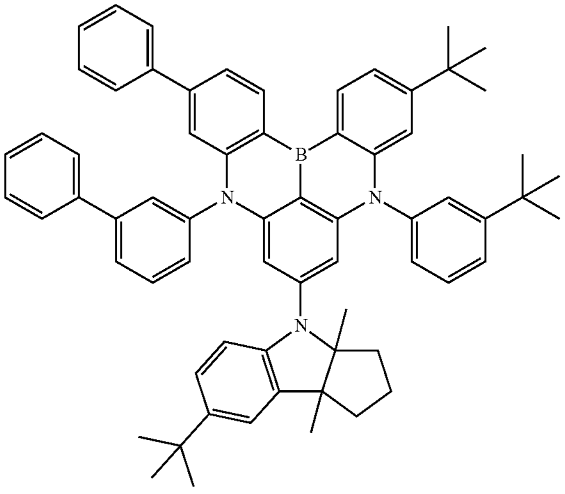
-continued
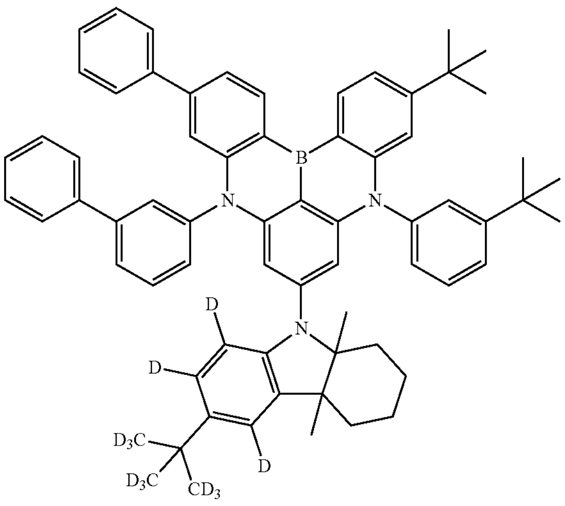
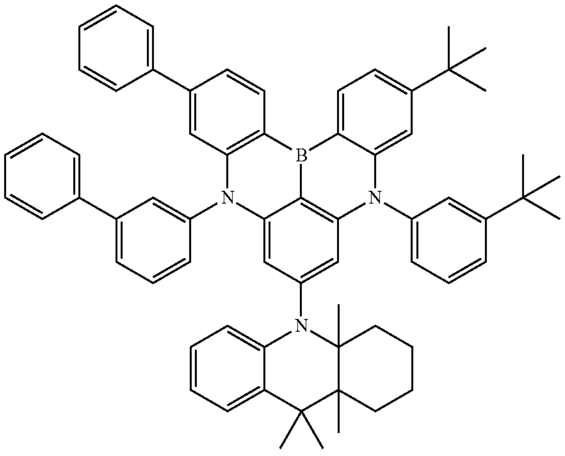
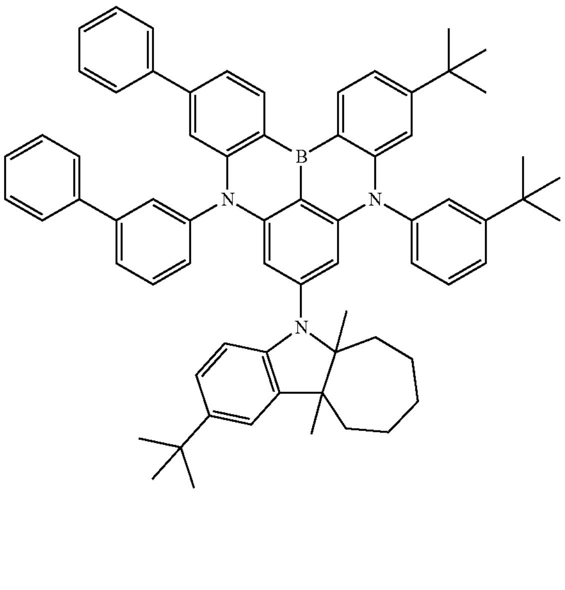

-continued
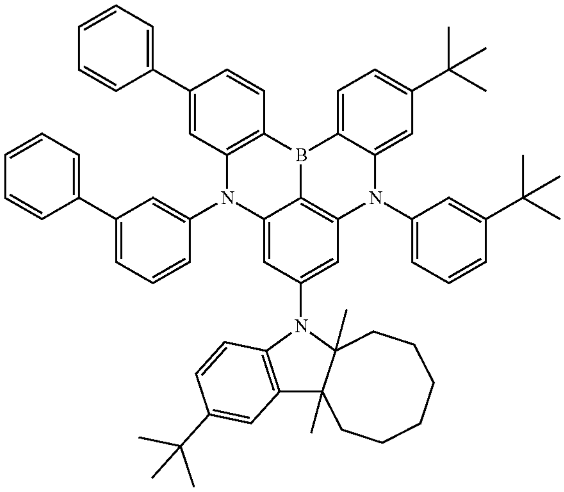
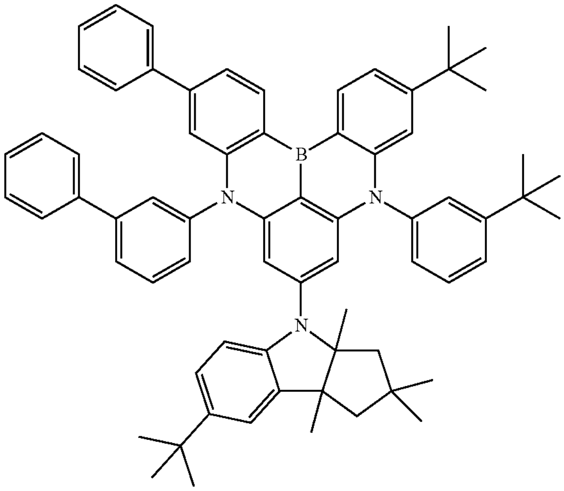
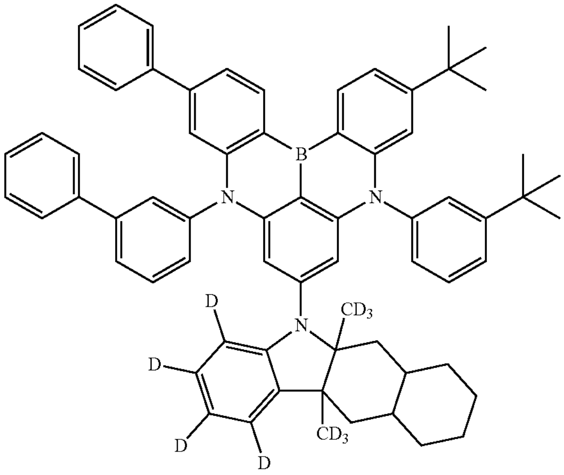
-continued
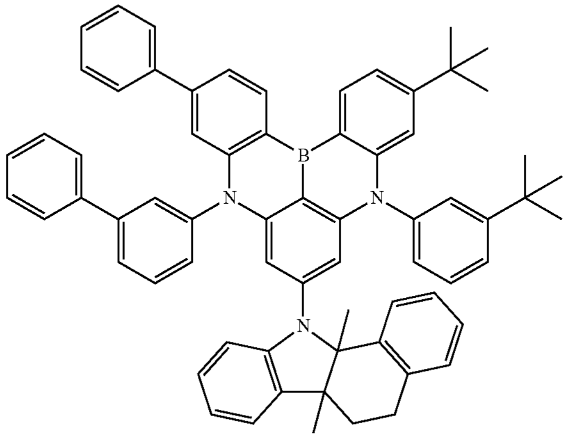
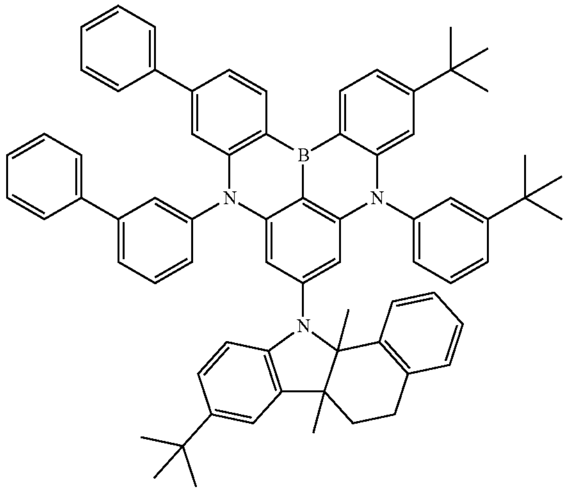 [SMILES: CC(C)(C)c1cccc(N2c3cc(C(C)(C)C)ccc3B3c4ccc(-c5ccccc5)cc4N(c4cccc(-c5ccccc5)c4)c4cc(N5c6ccc(C(C)(C)C)cc6C6(C)CCc7ccccc7C56C)cc2c43)c1]
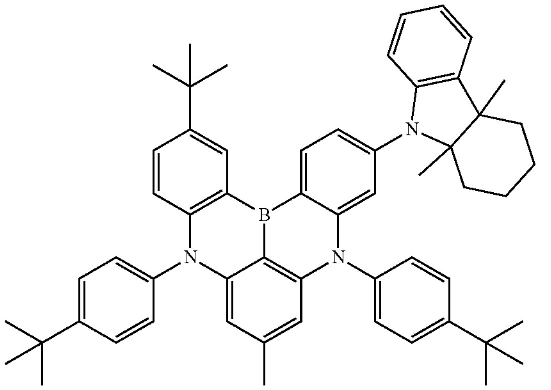

-continued
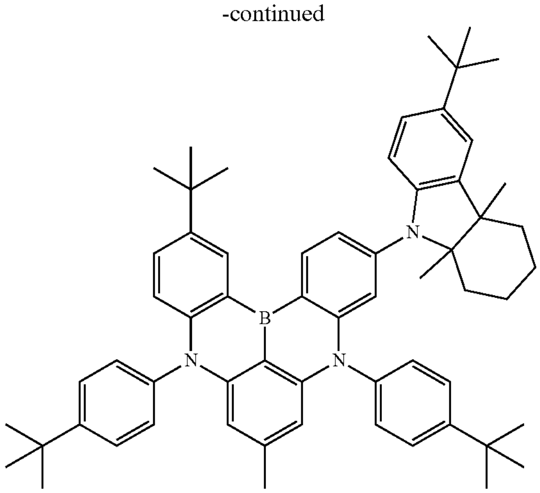
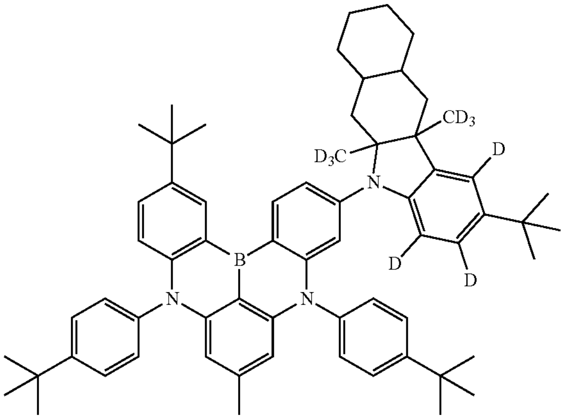
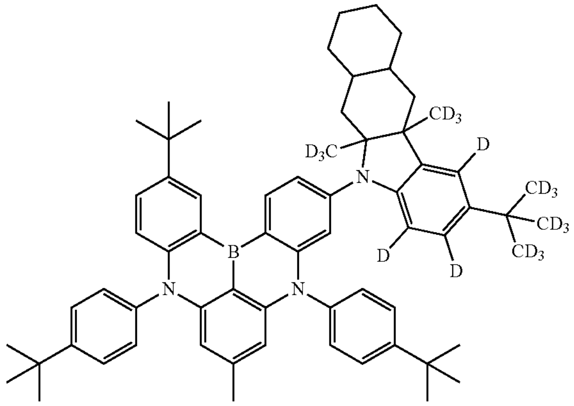
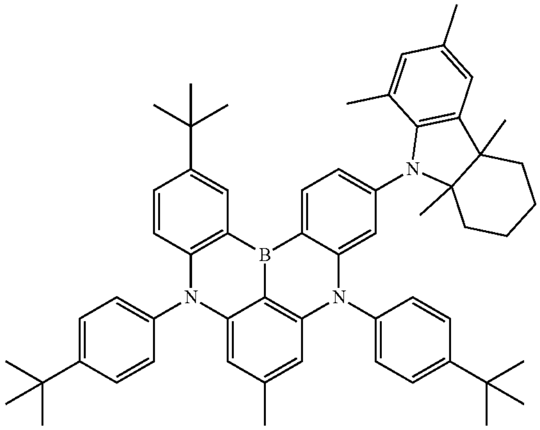
-continued
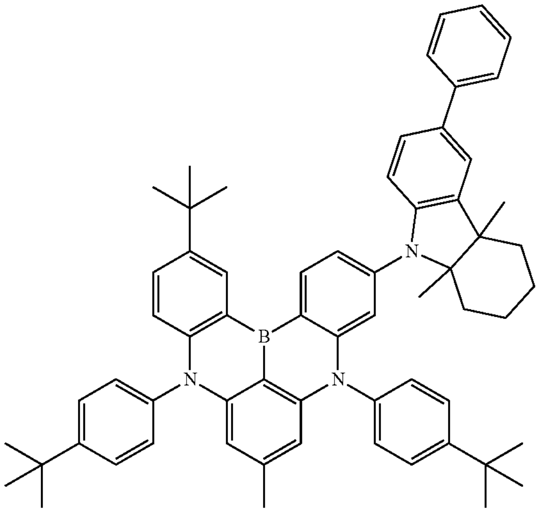
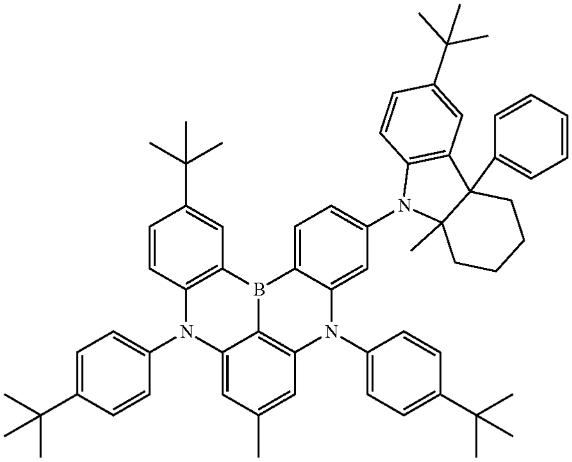
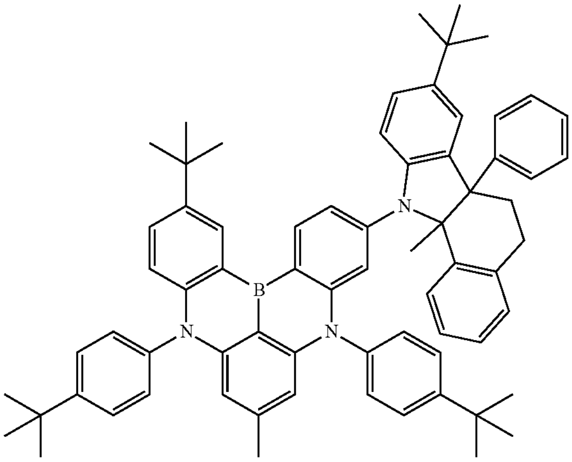

-continued
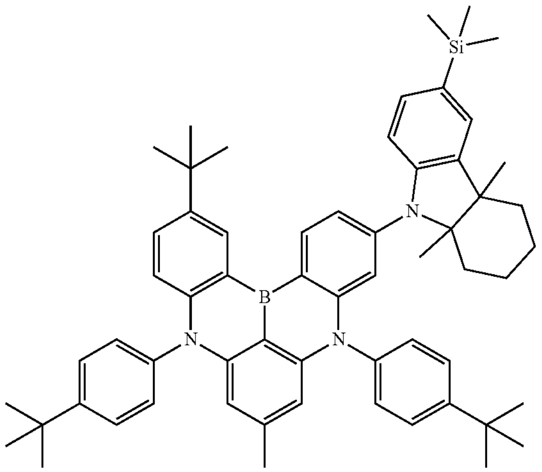
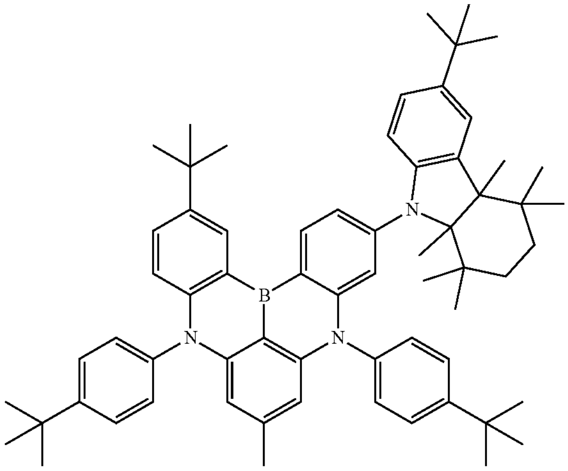
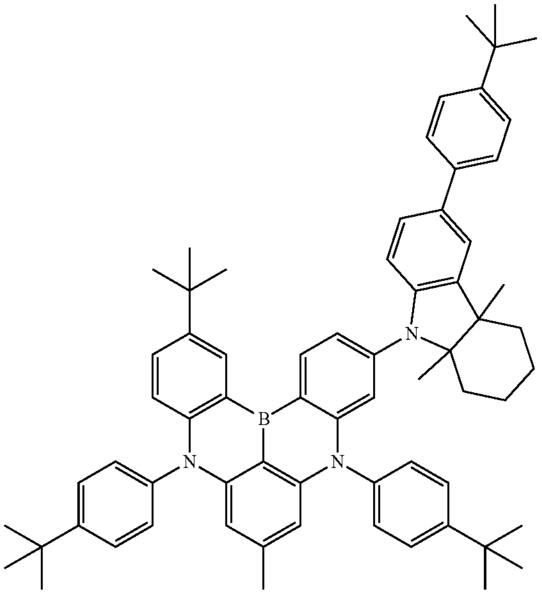
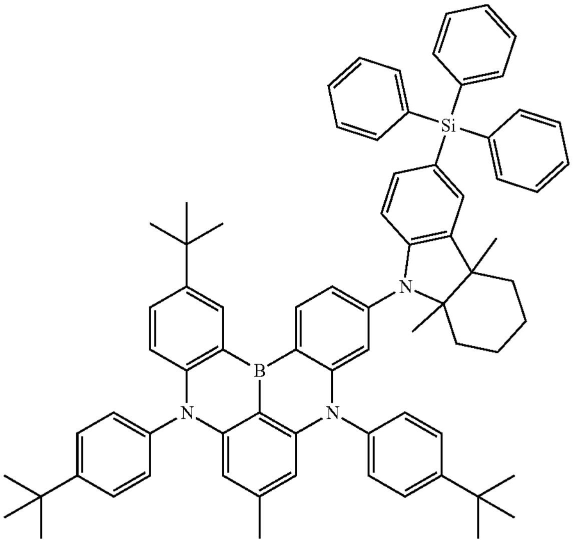
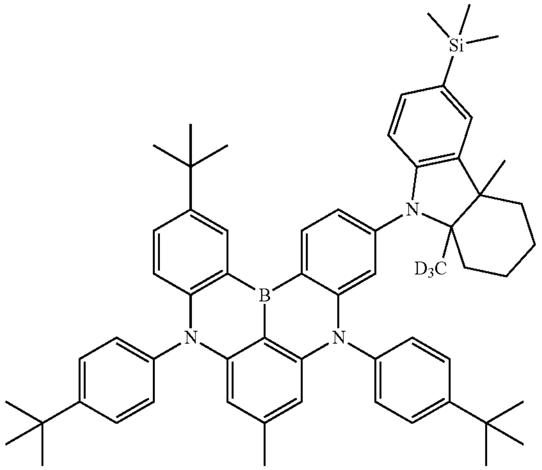
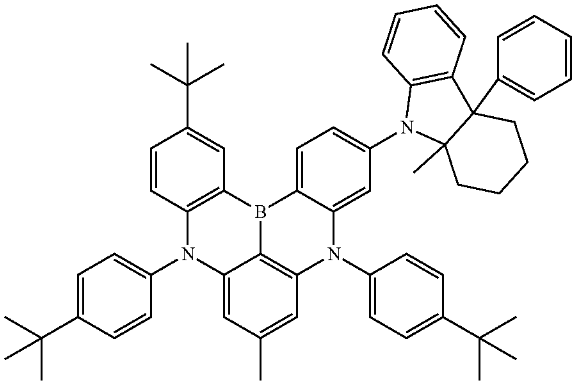
-continued

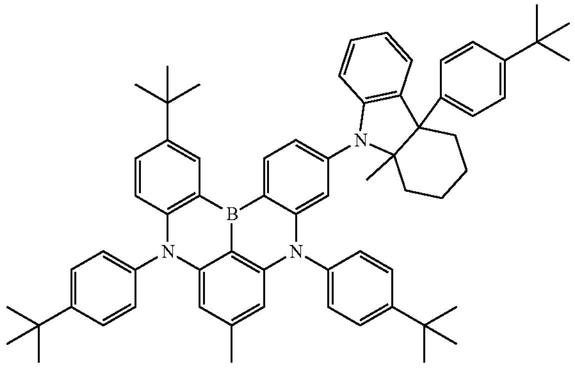
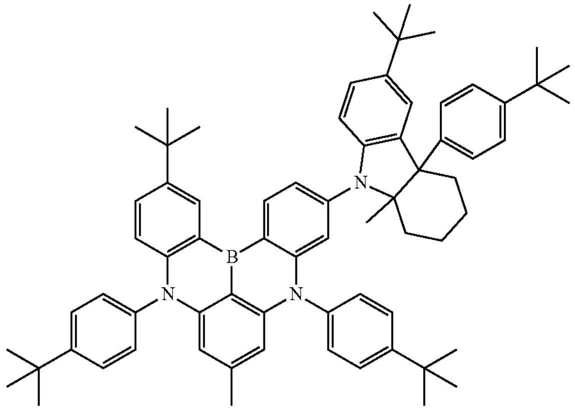
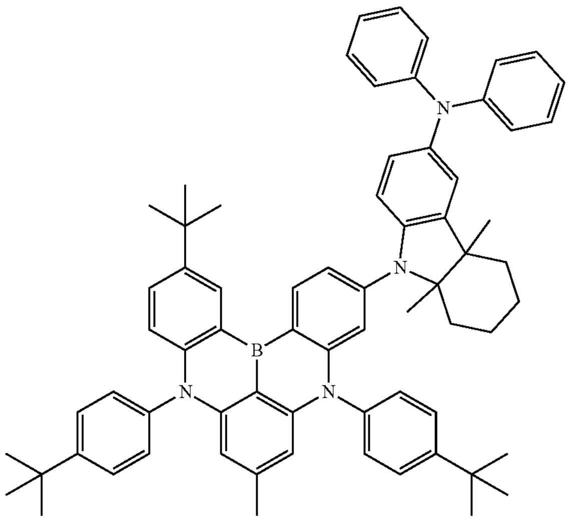
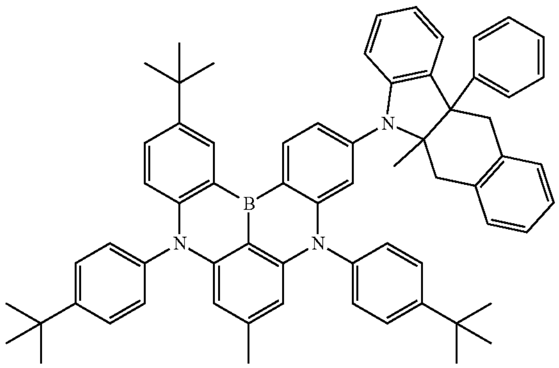
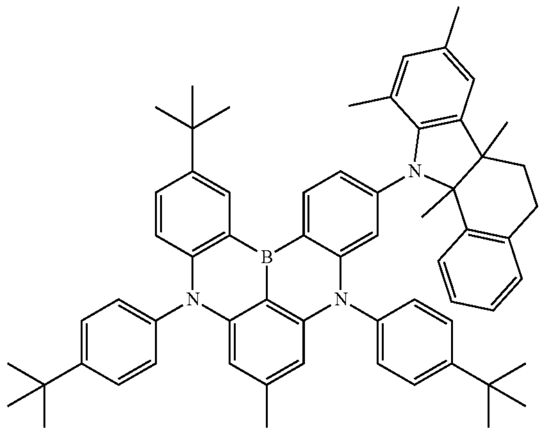
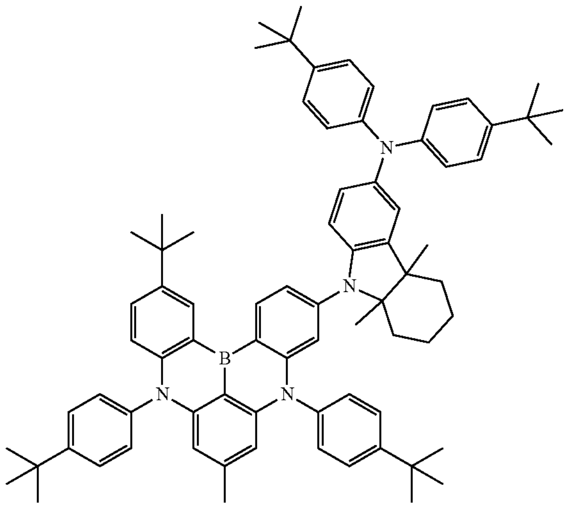
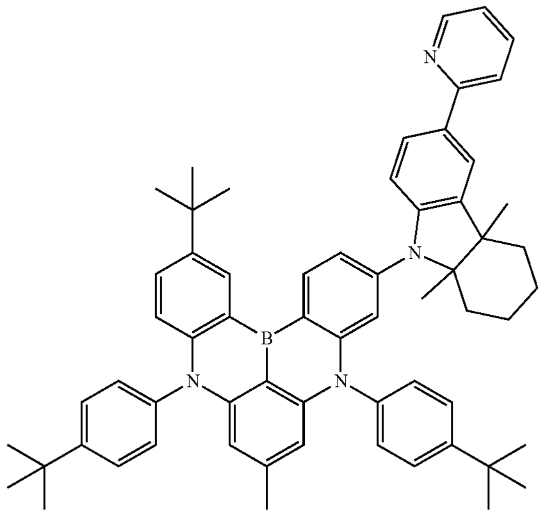

-continued
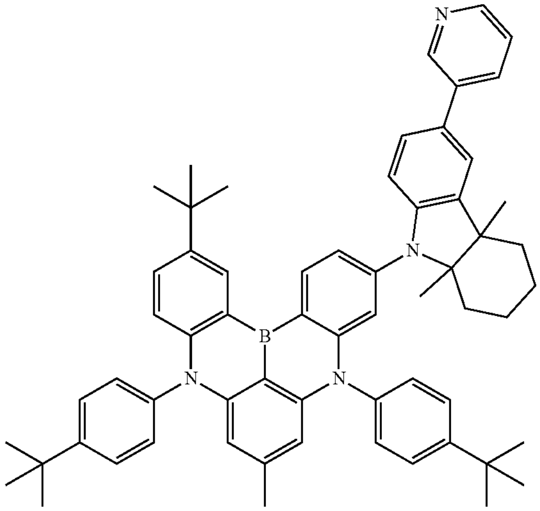
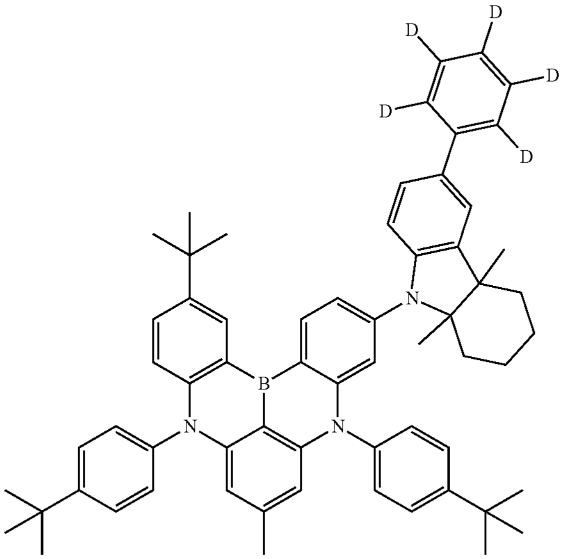
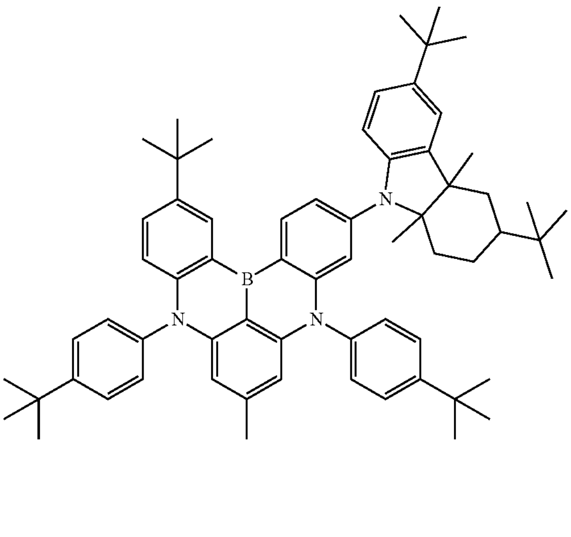
-continued
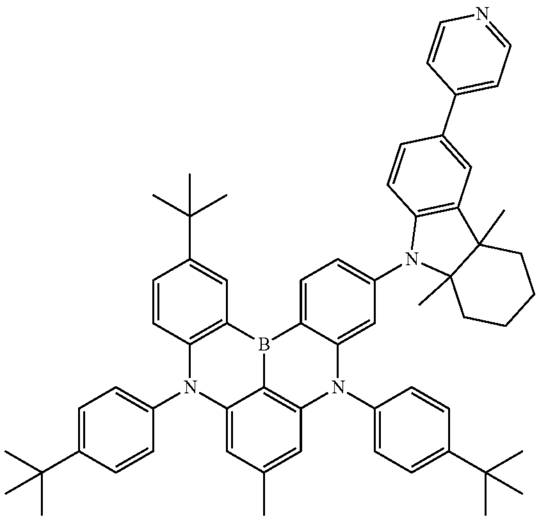
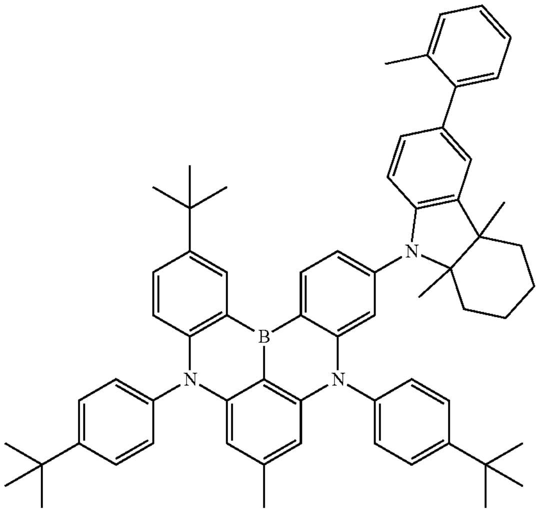
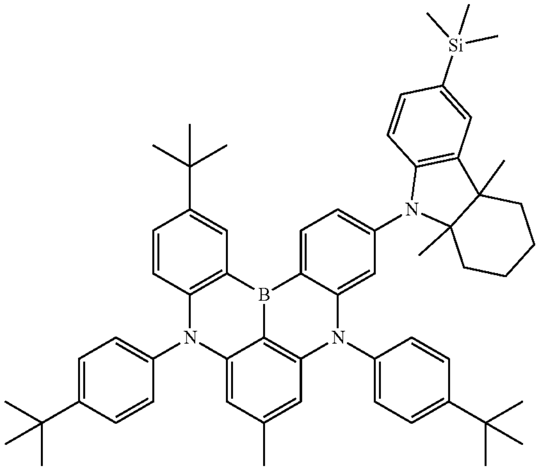

-continued
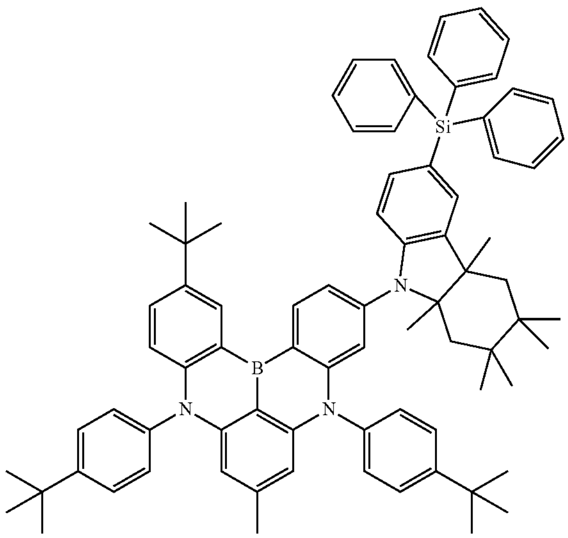
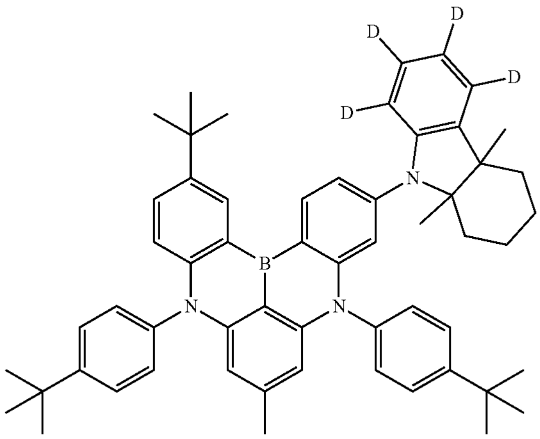
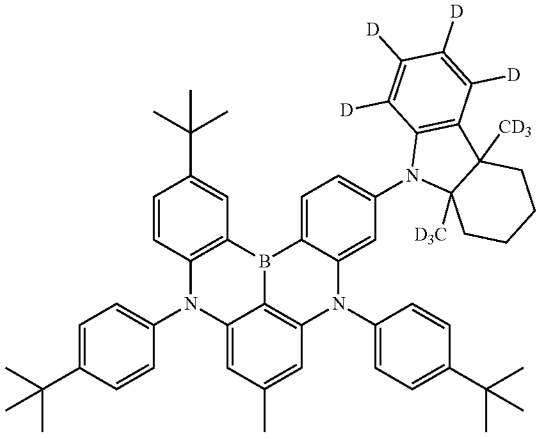
-continued
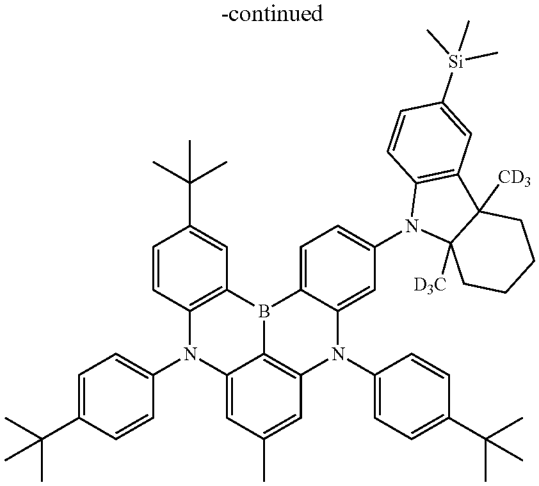
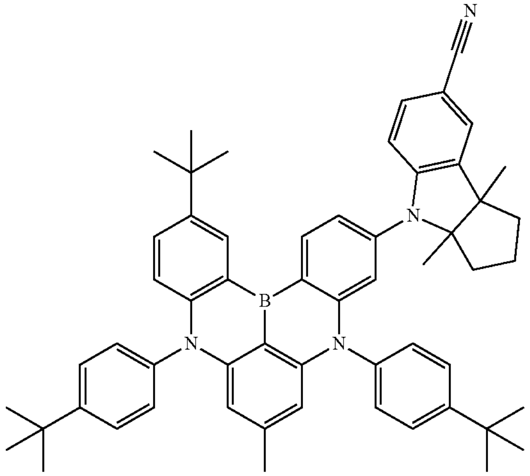
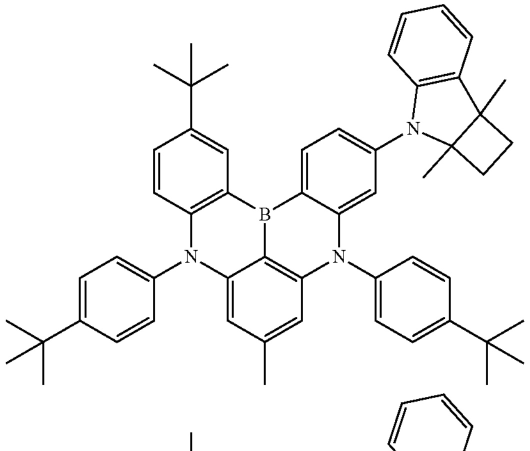
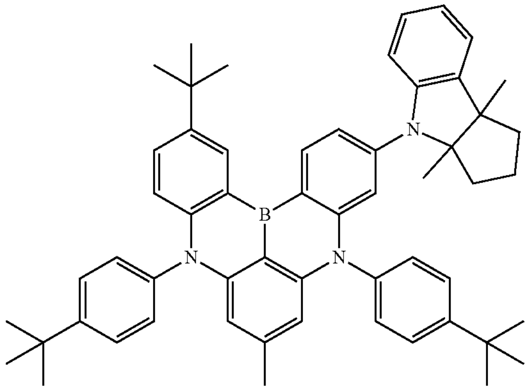

-continued
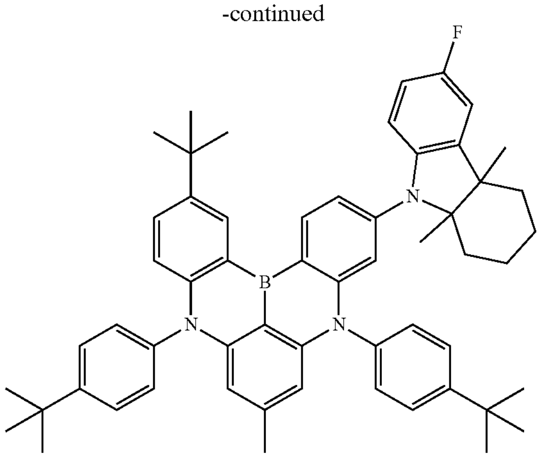
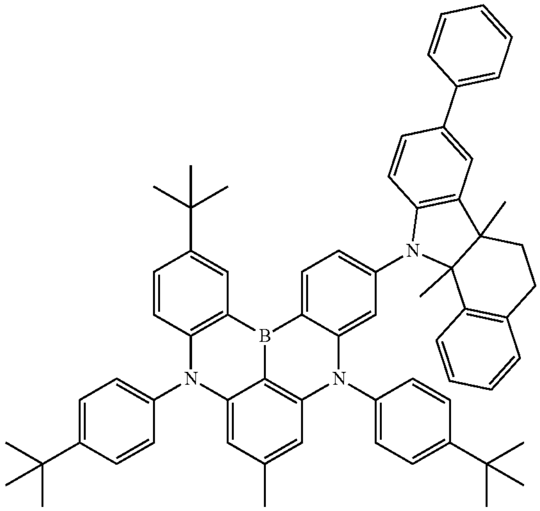
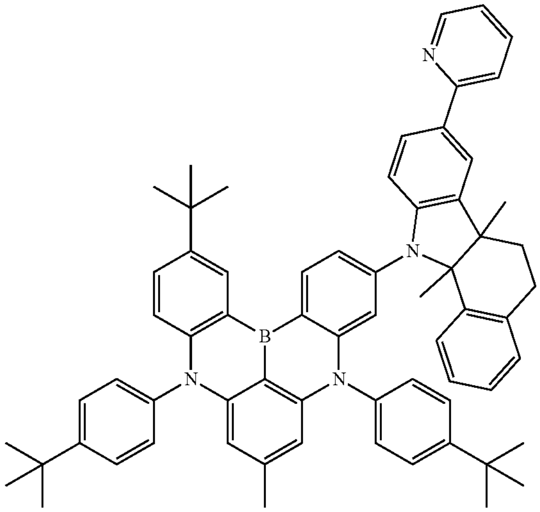
-continued
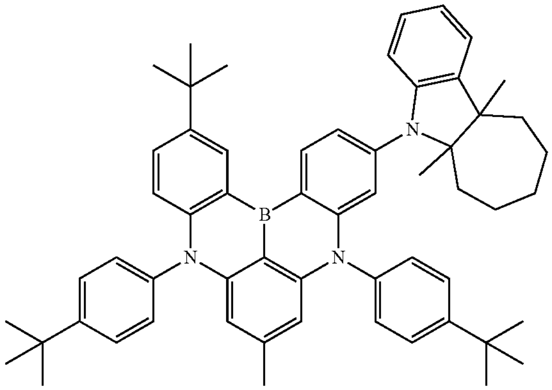
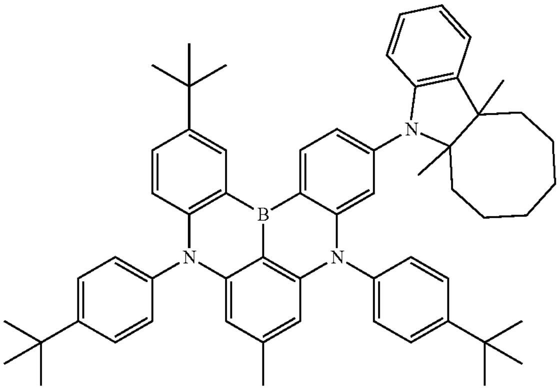
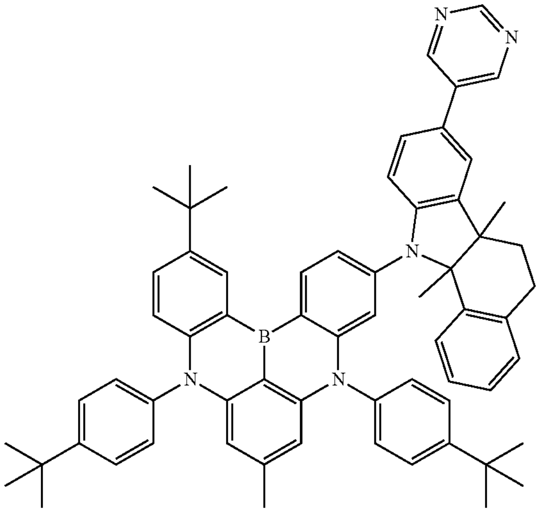

-continued
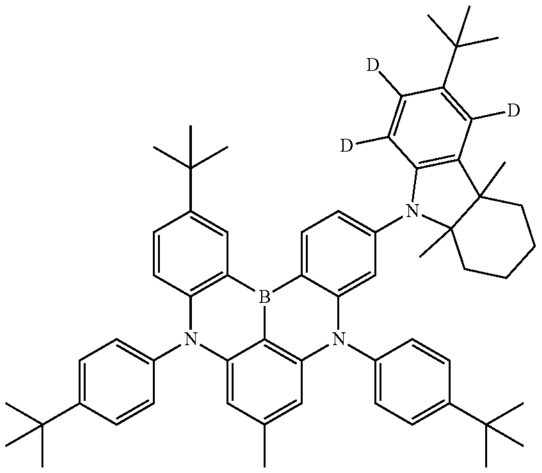
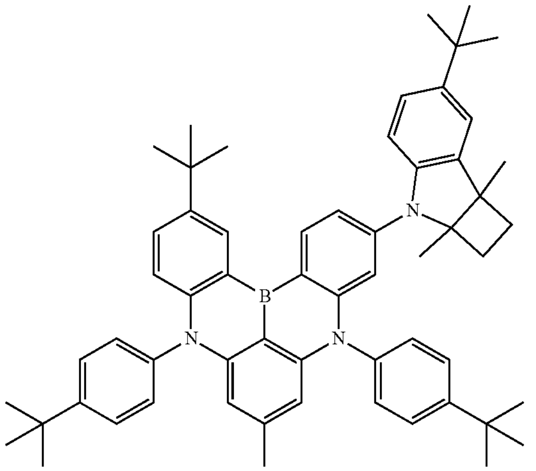
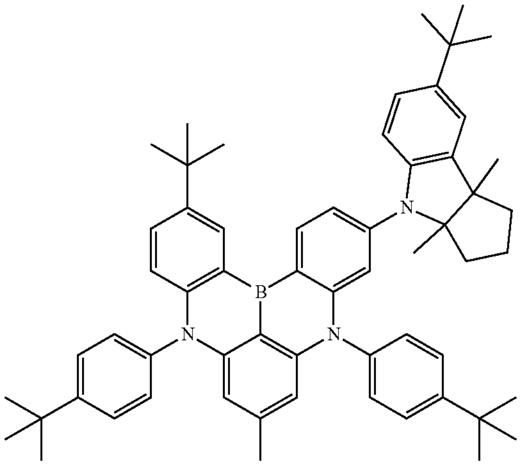
-continued
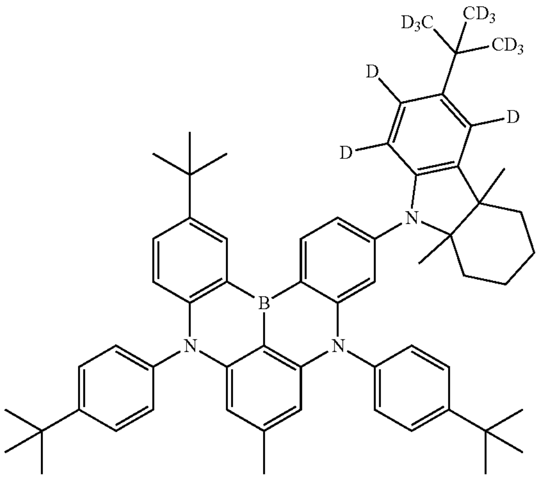
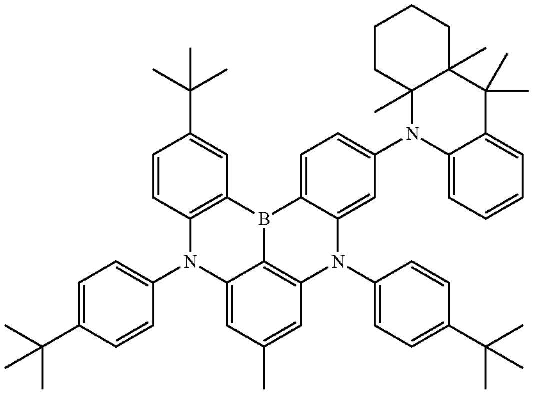
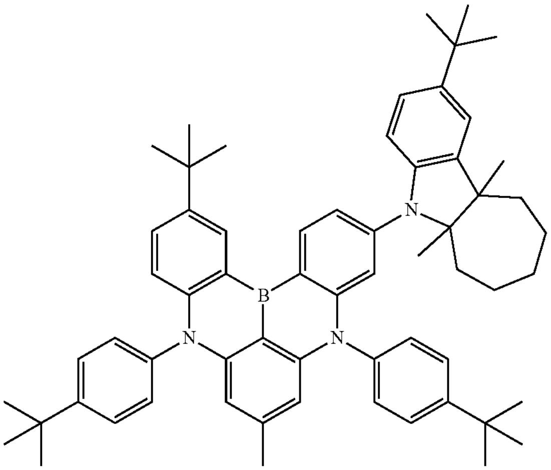

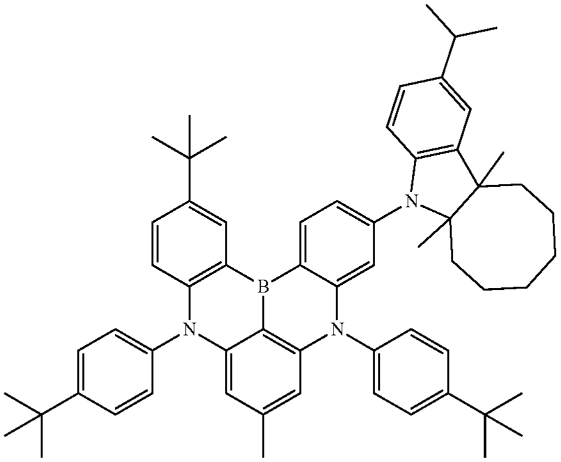
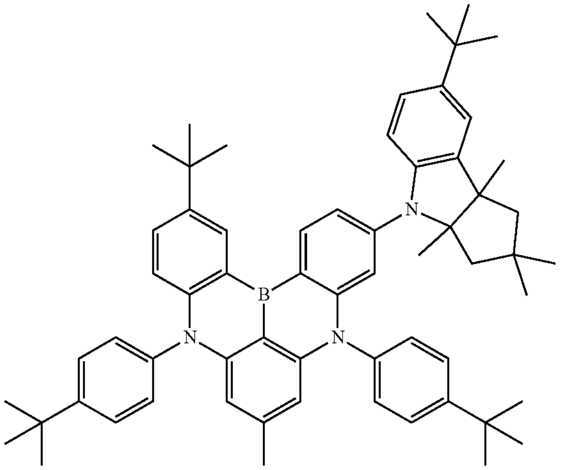
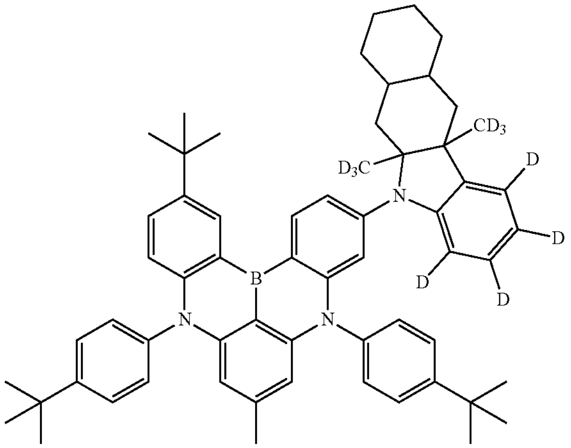
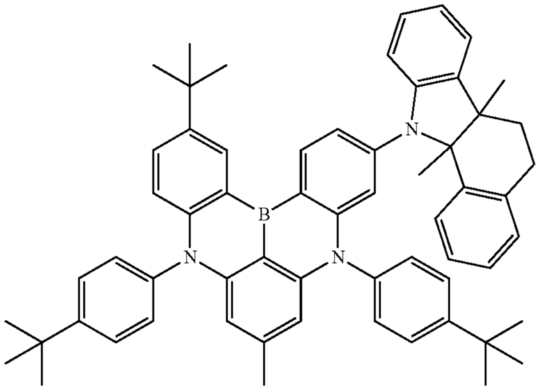
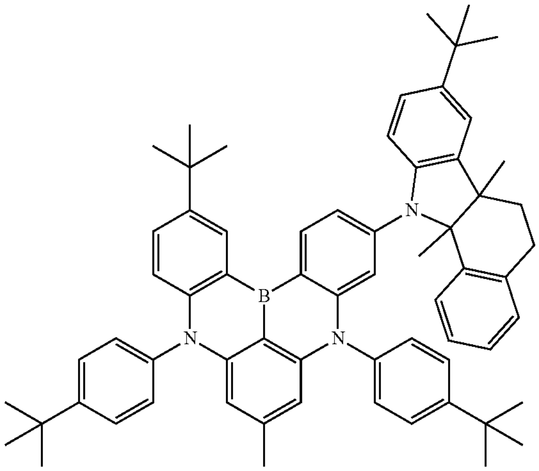
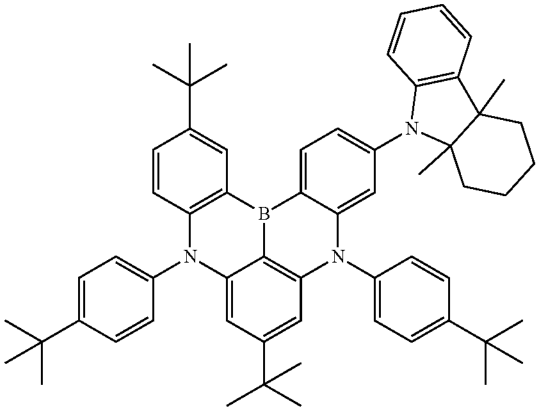

-continued
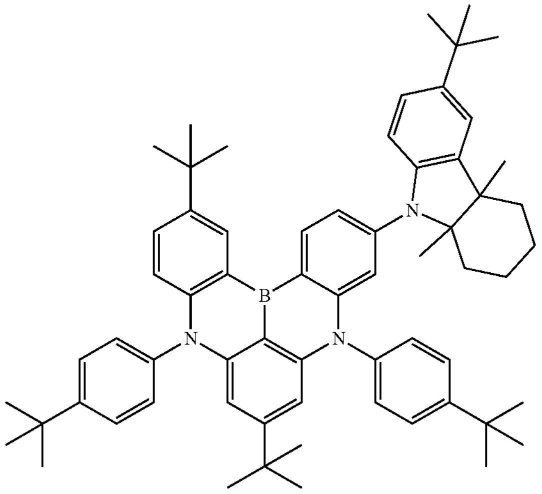
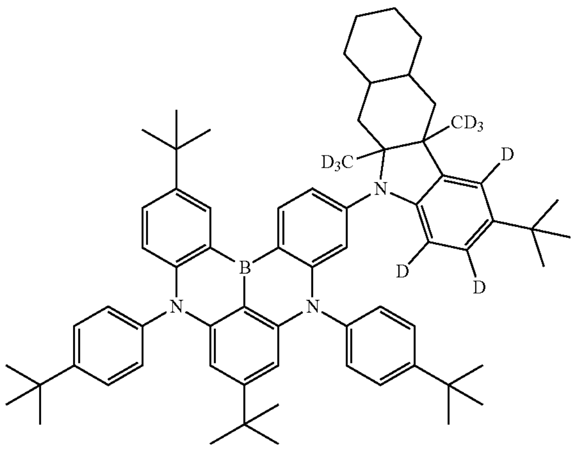
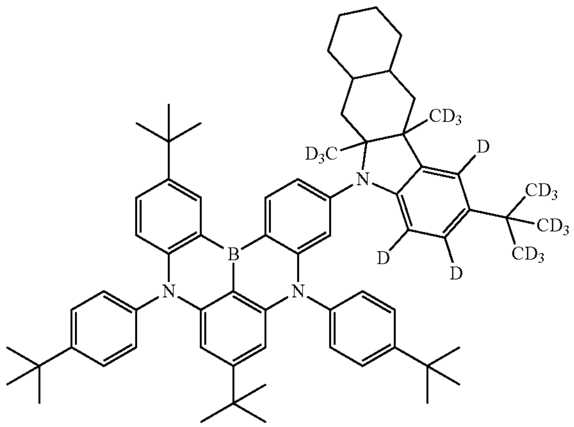
-continued
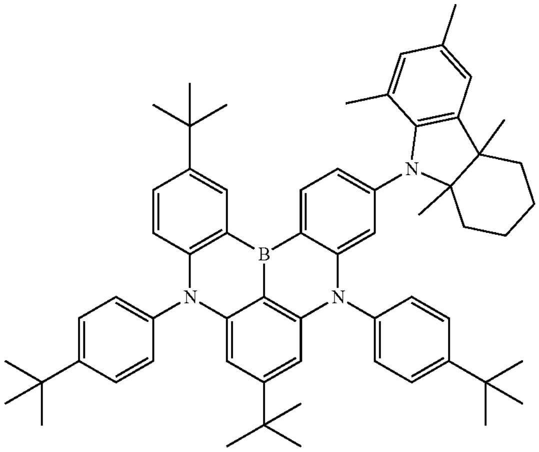
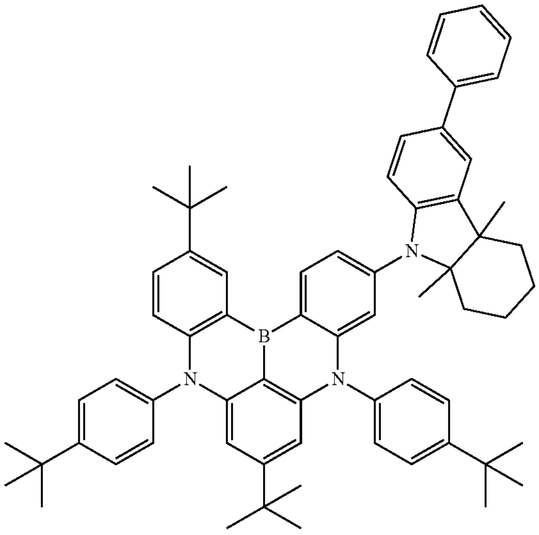
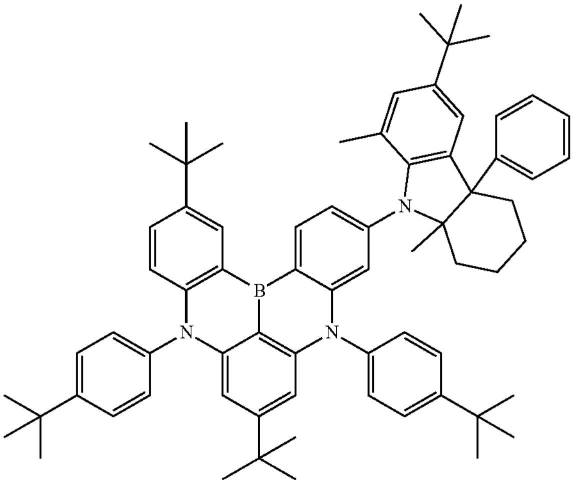

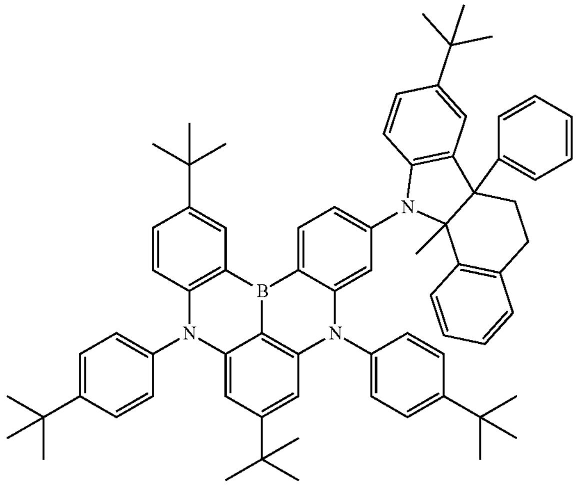
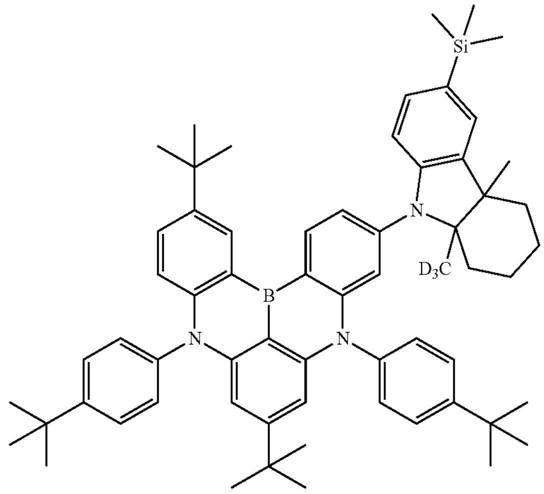
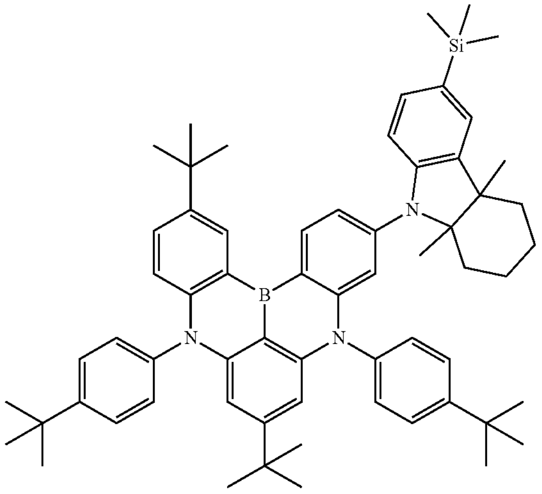
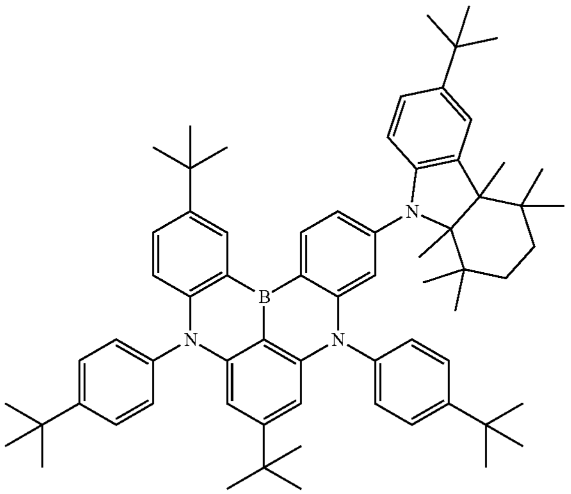
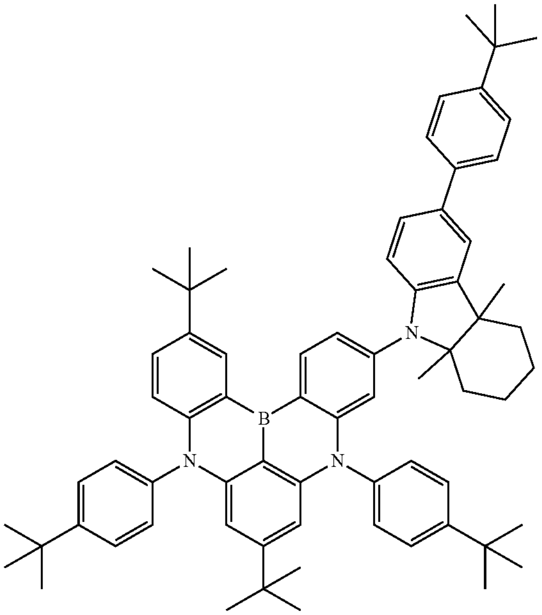
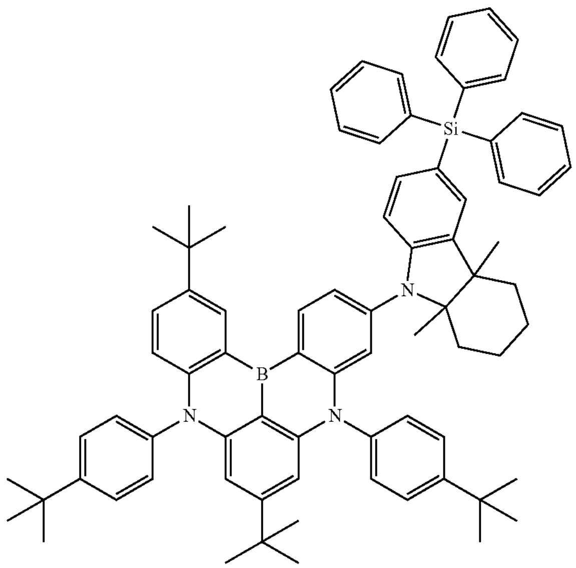

-continued
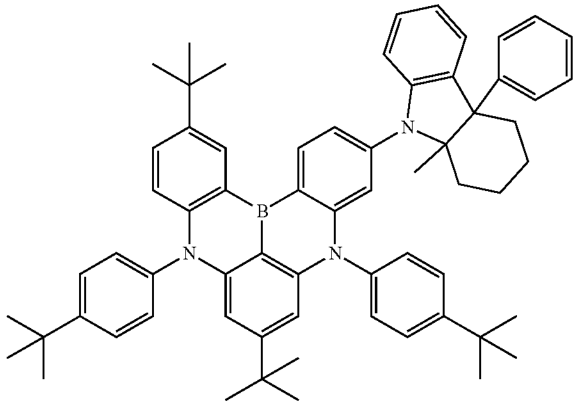
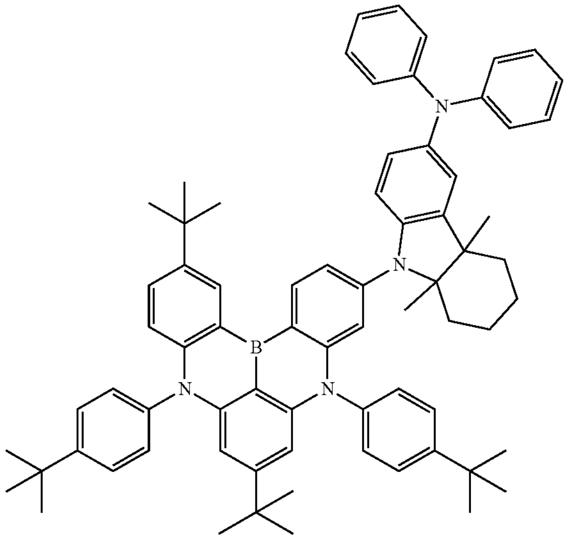
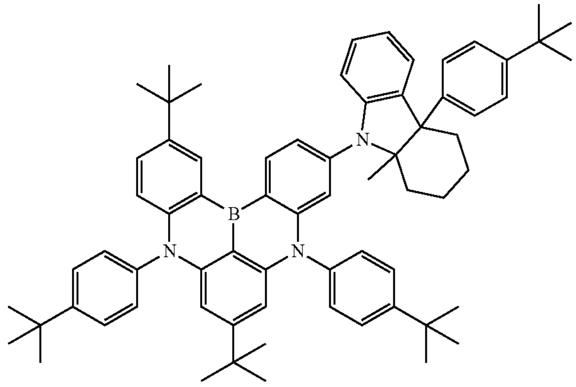
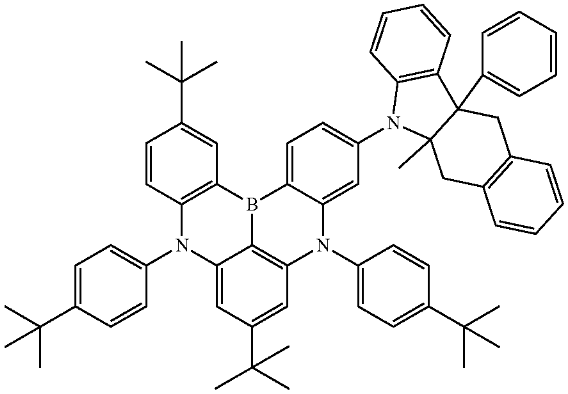
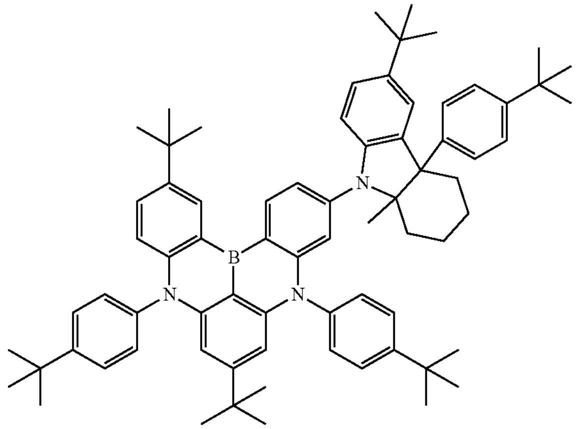
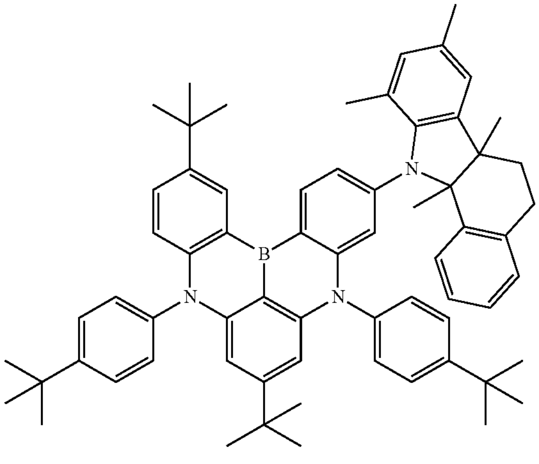

-continued
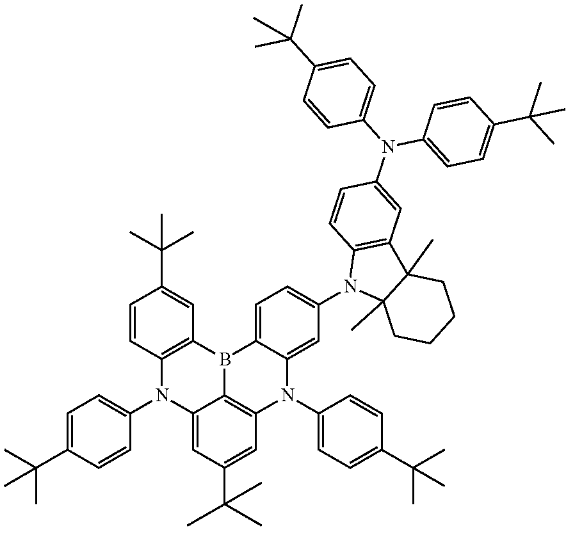
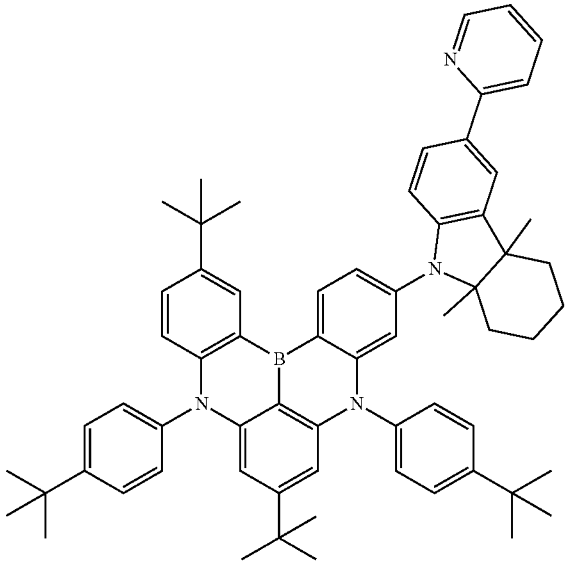
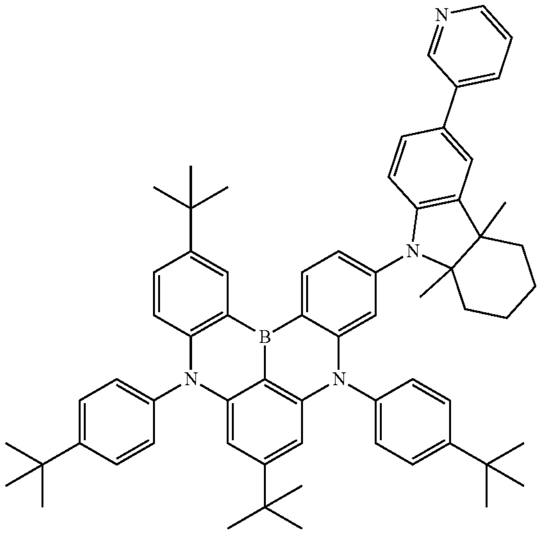
-continued
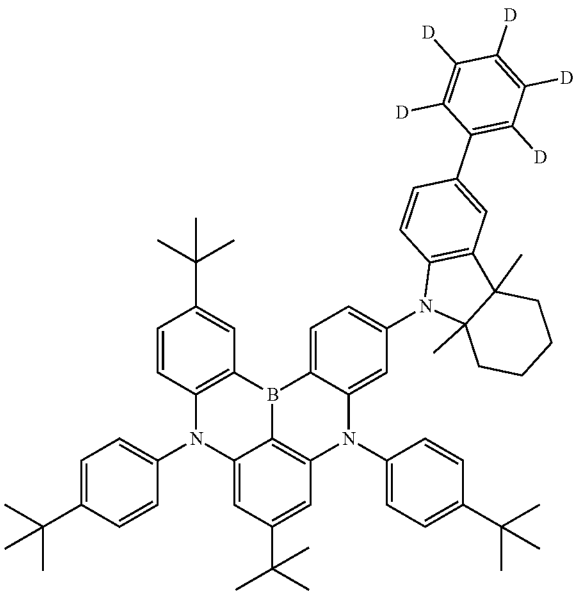
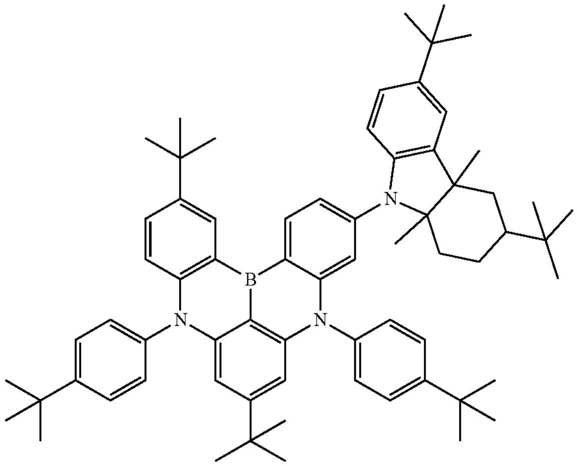
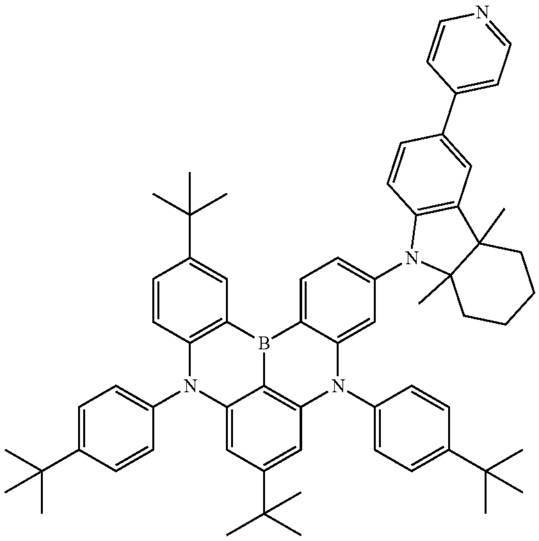

-continued
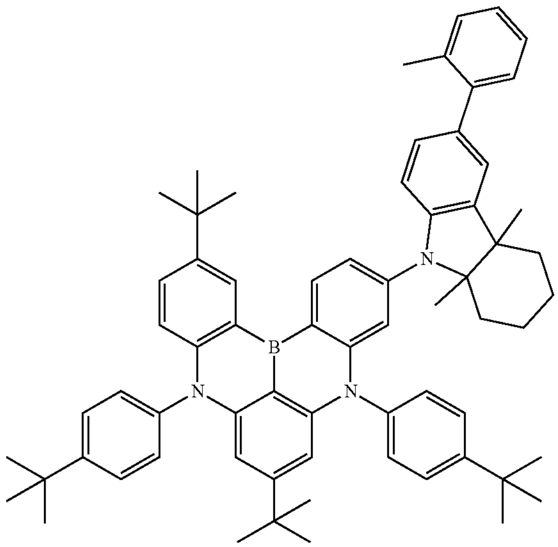
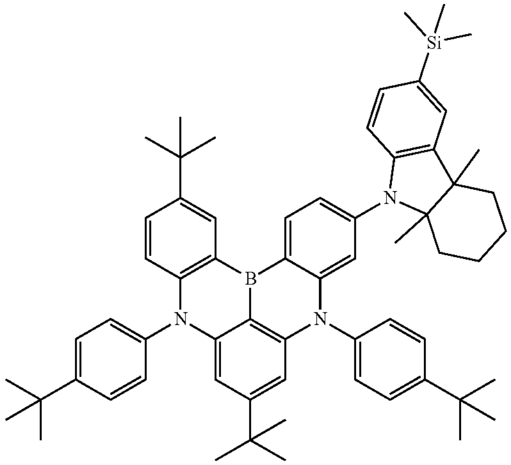
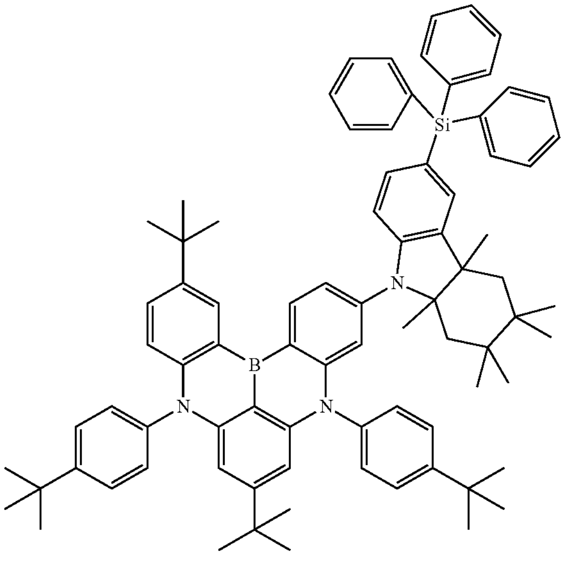
-continued
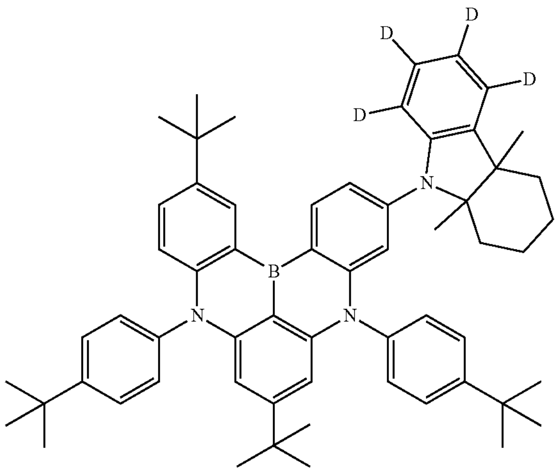
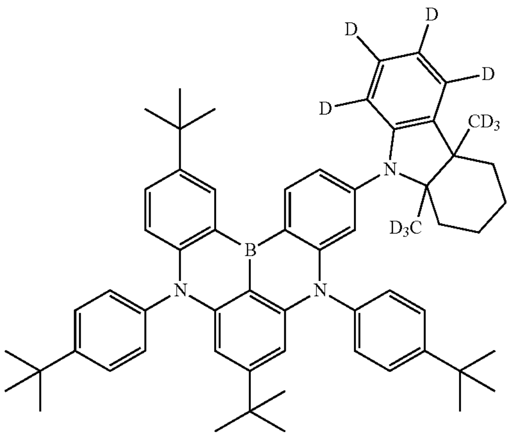
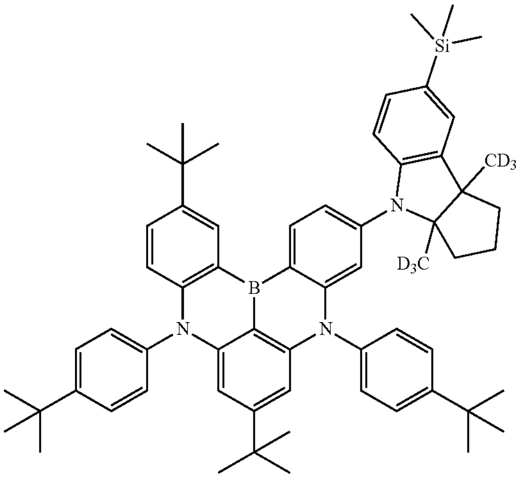

-continued
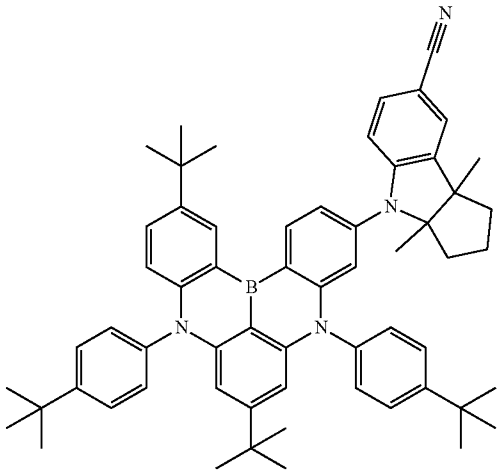 [SMILES: CC(C)(C)c1ccc(N2c3ccc(C(C)(C)C)cc3B3c4ccc(N5c6ccc(C#N)cc6C6(C)CCCC56C)cc4N(c4ccc(C(C)(C)C)cc4)c4cc(C(C)(C)C)cc2c43)cc1]
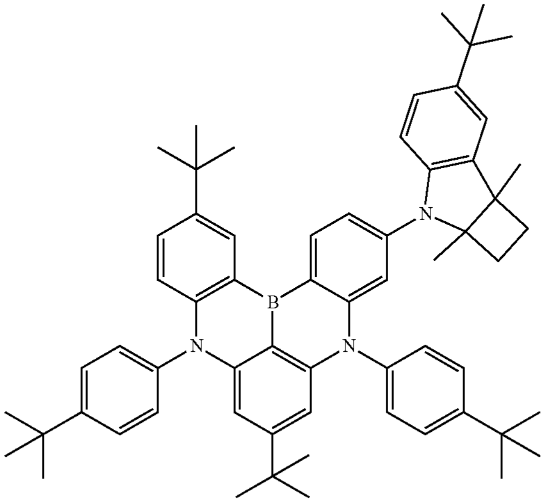
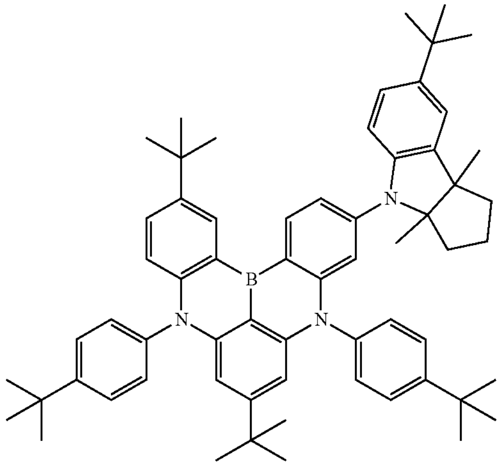
-continued
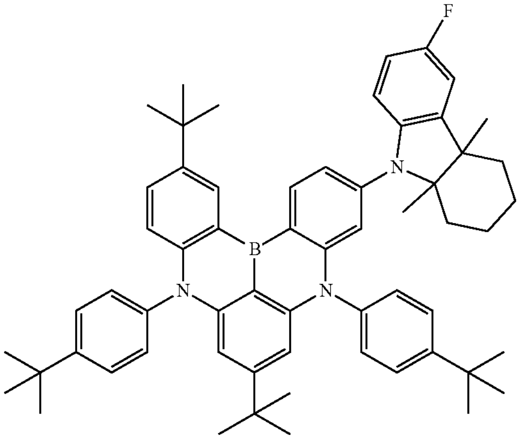
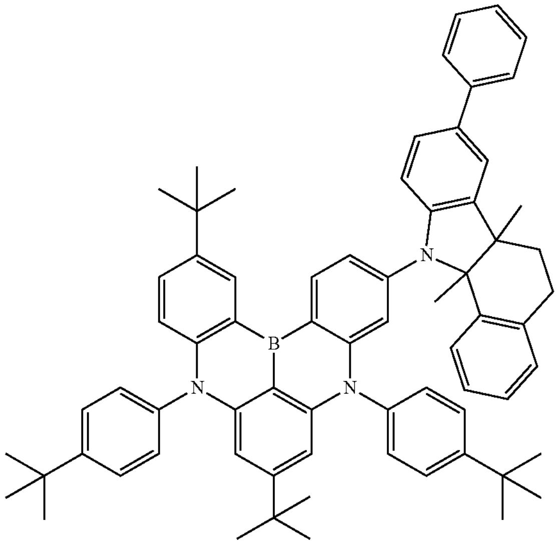
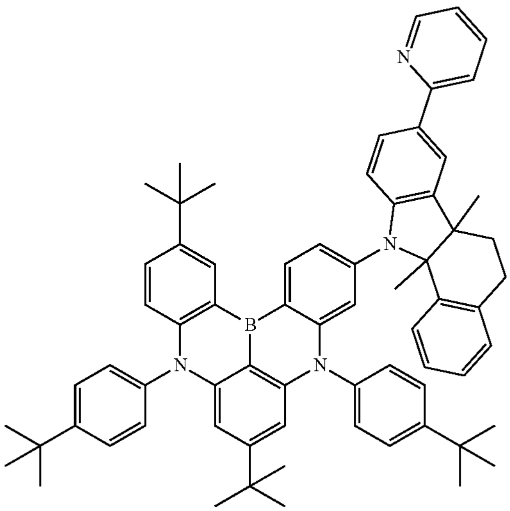

-continued
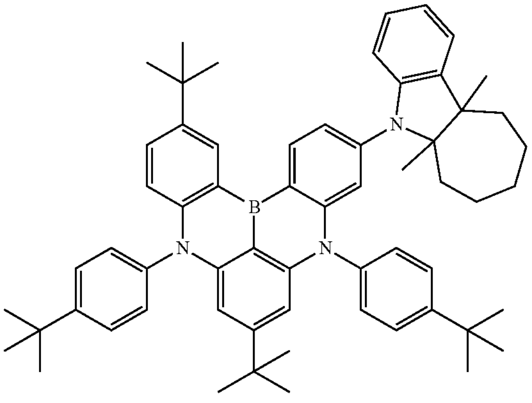
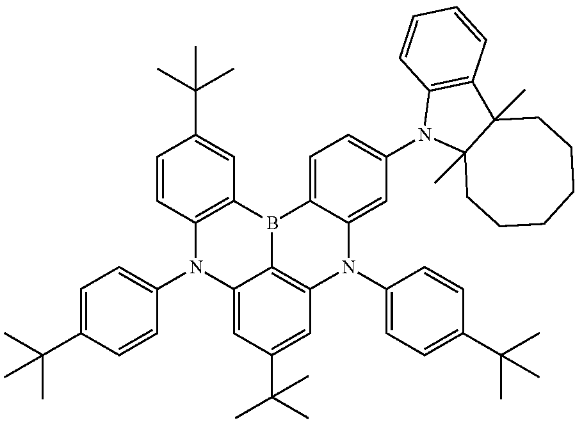
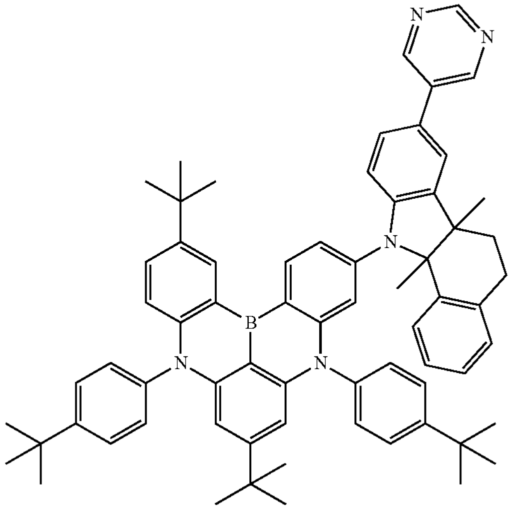
-continued
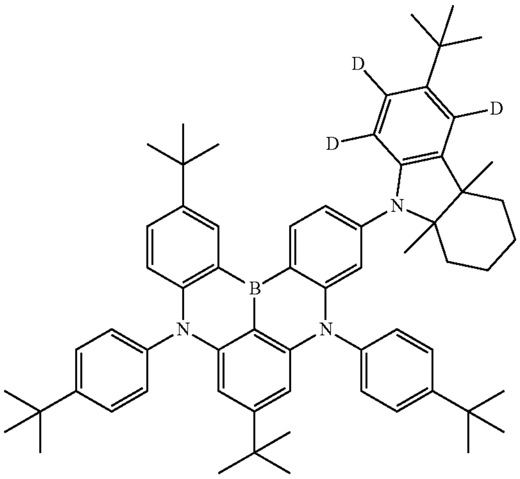
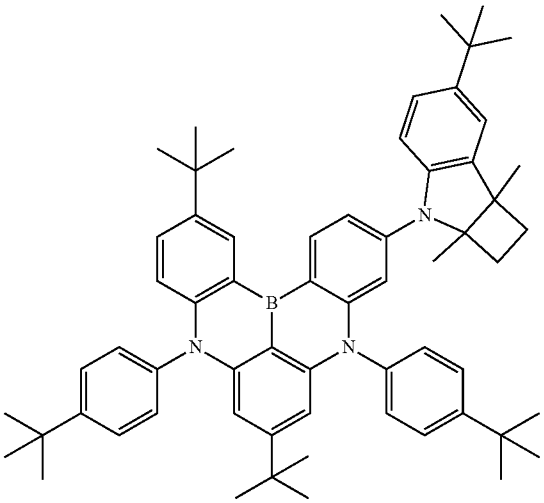
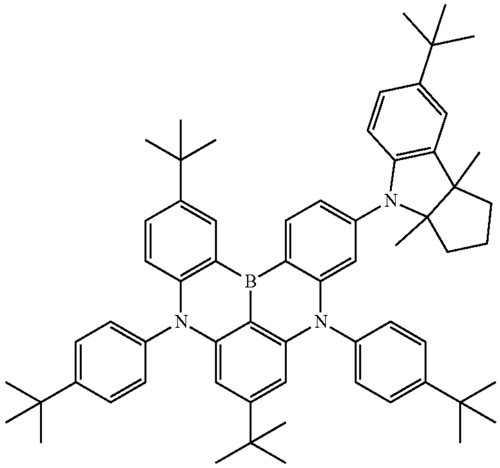

-continued
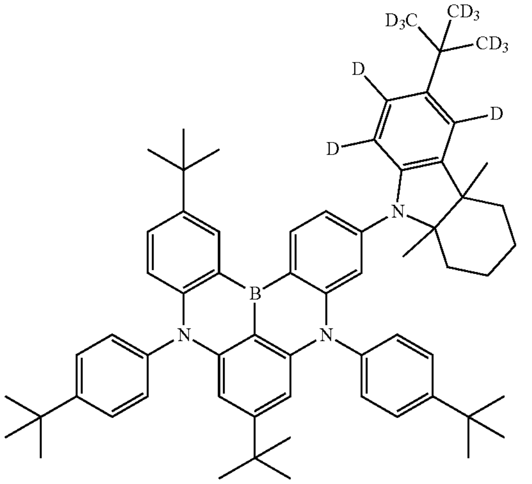
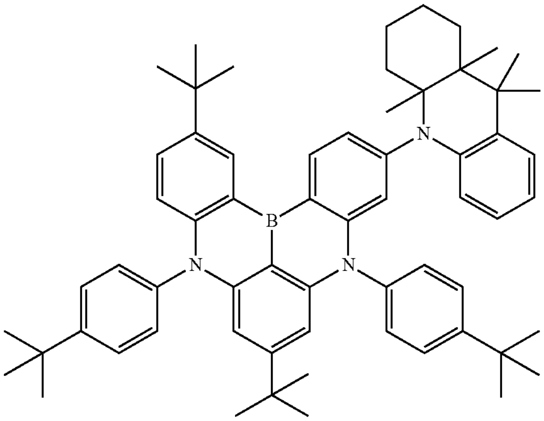
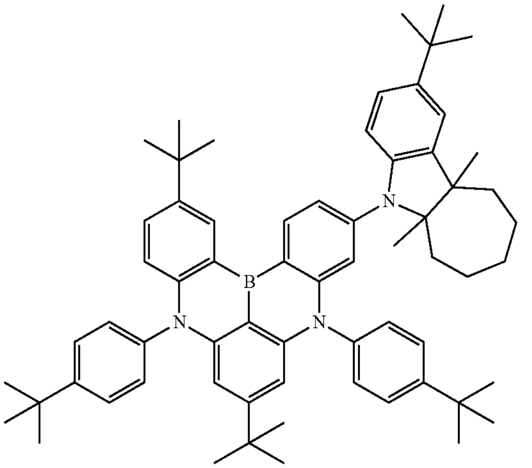
-continued
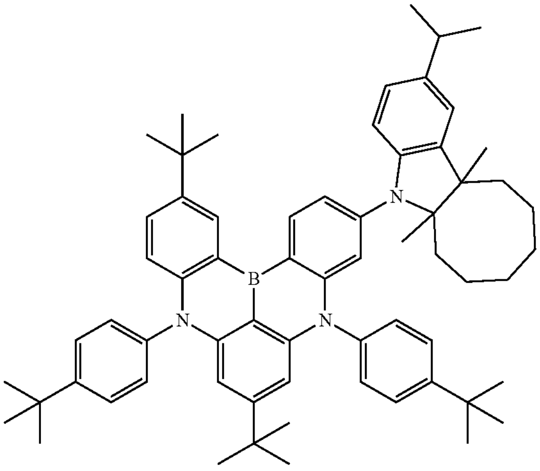
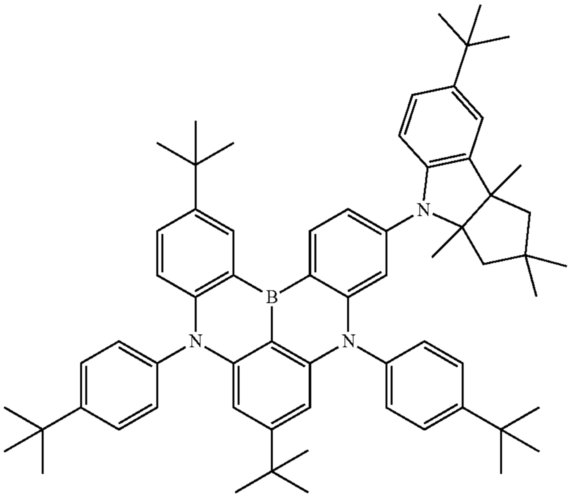
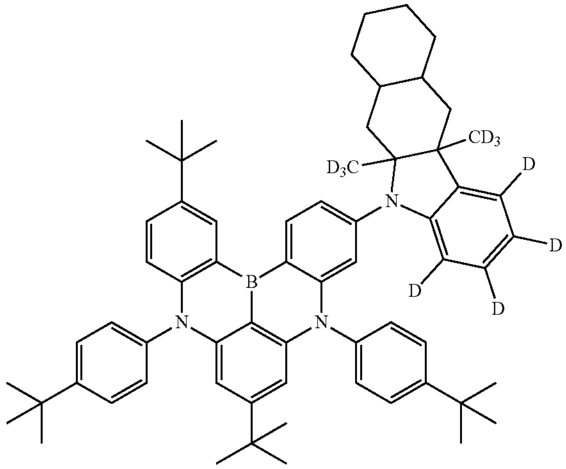

-continued
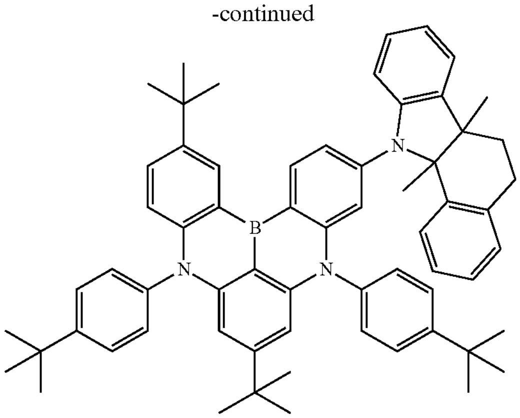
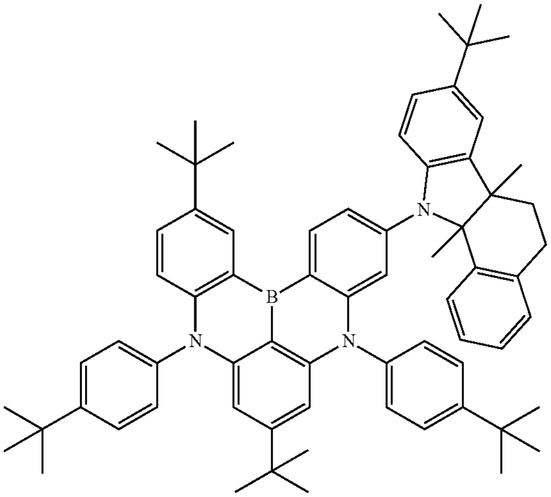
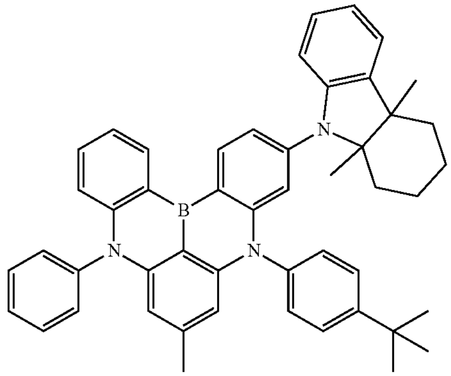
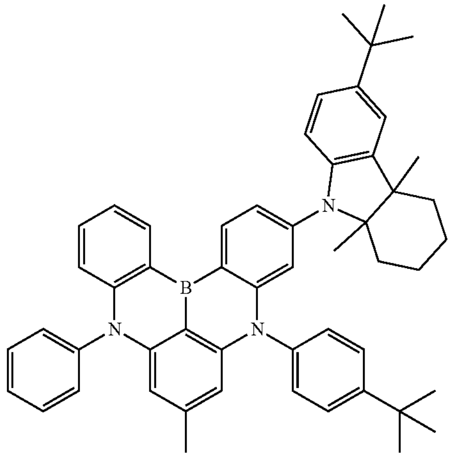
-continued
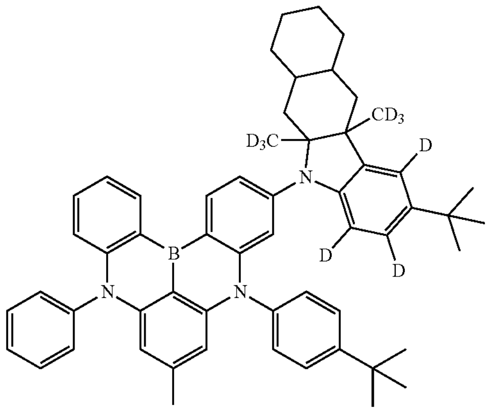
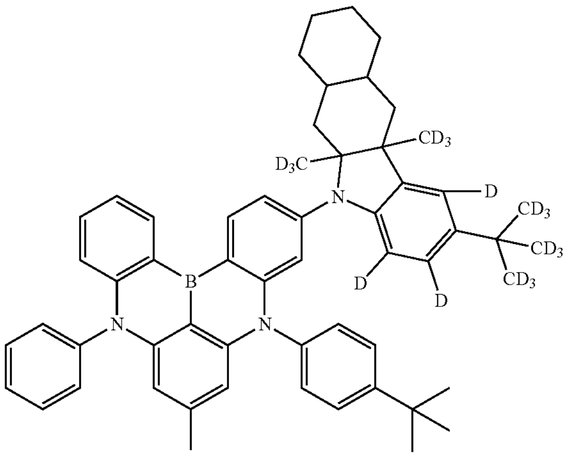
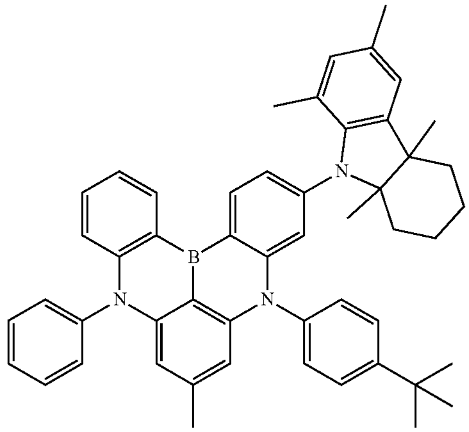

-continued
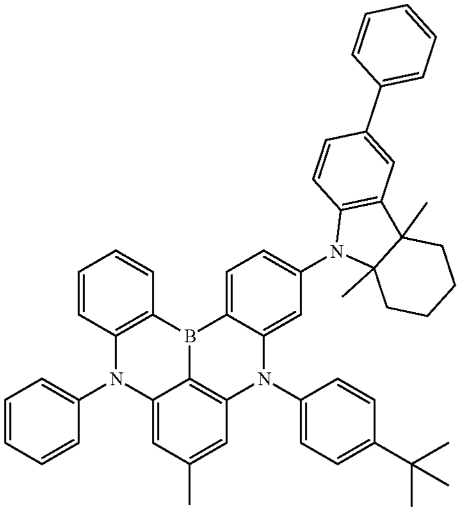
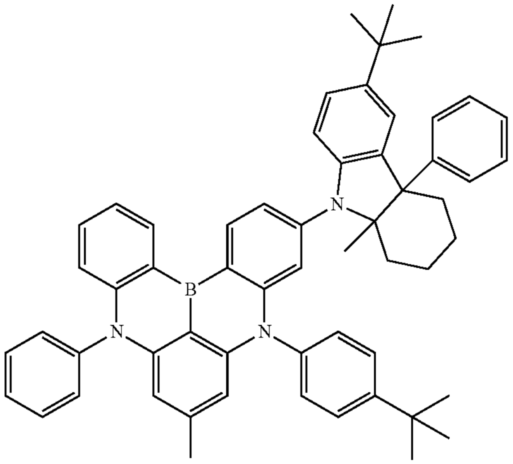
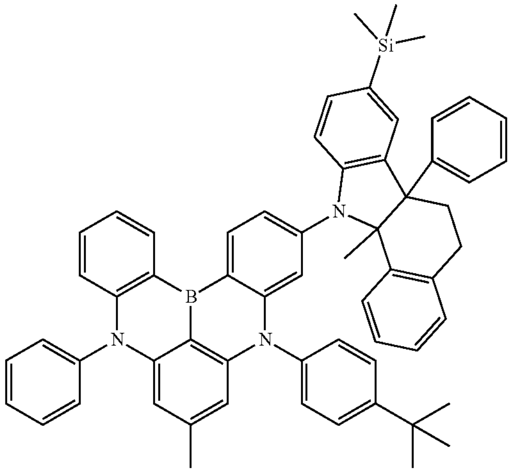
-continued
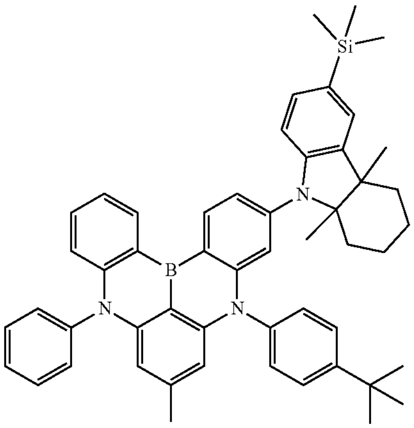
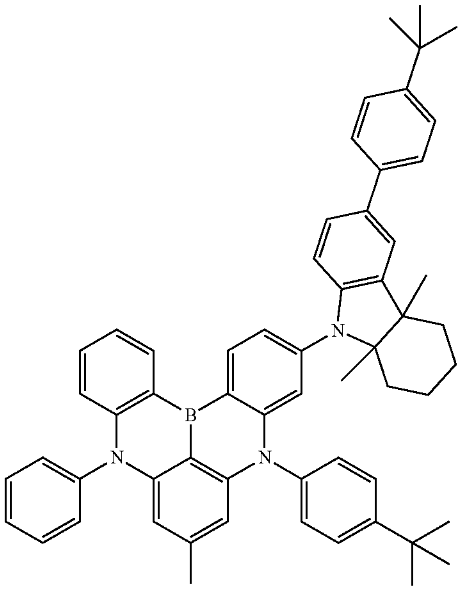
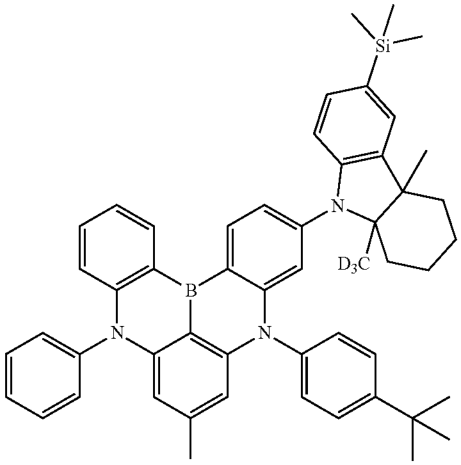

-continued
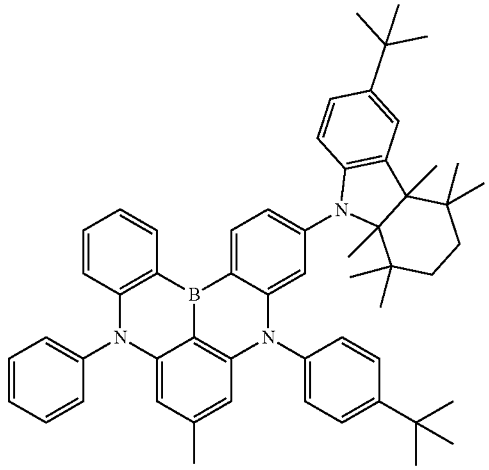
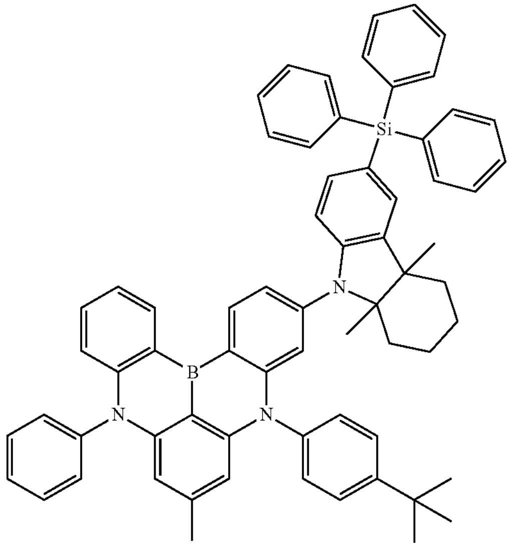
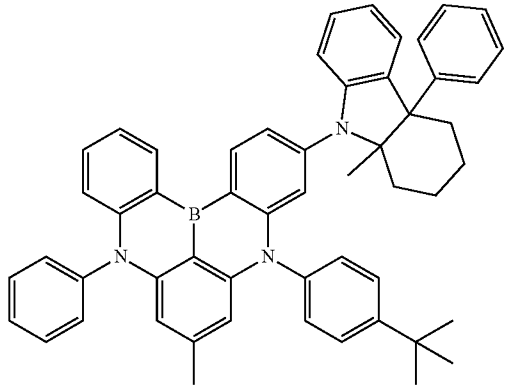
-continued
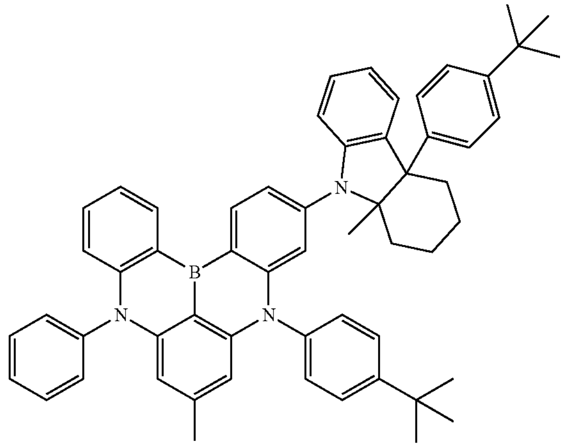
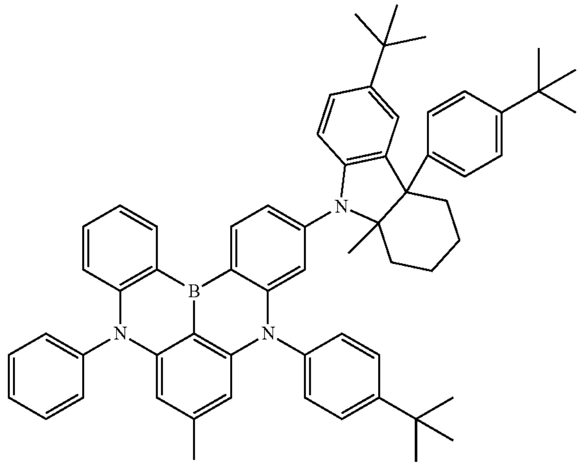
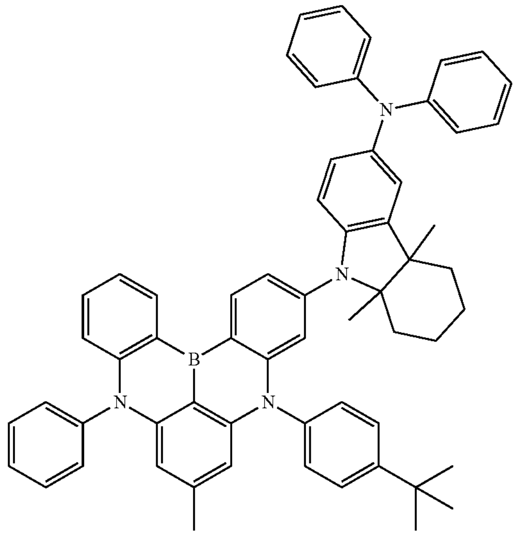

-continued
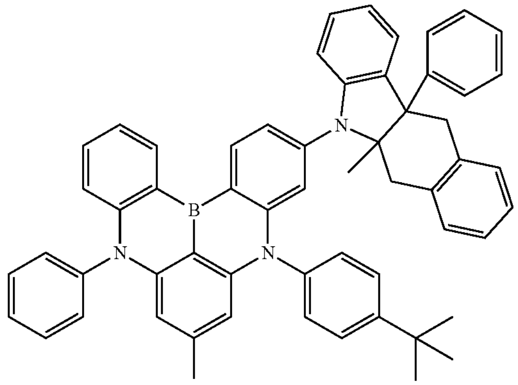
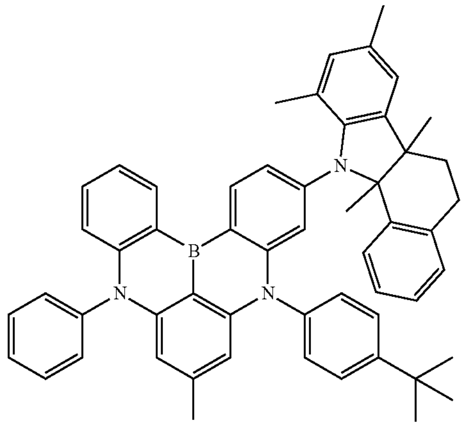
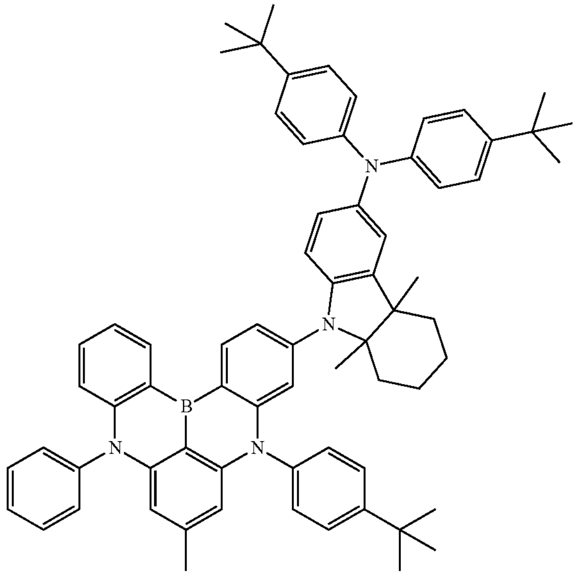
-continued
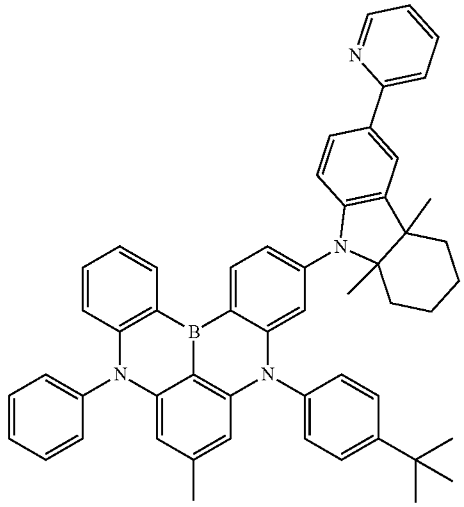
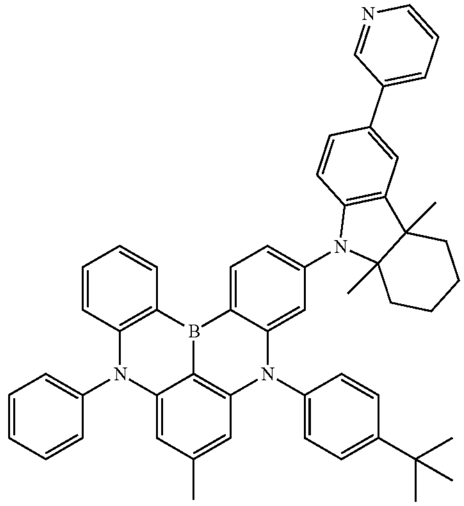
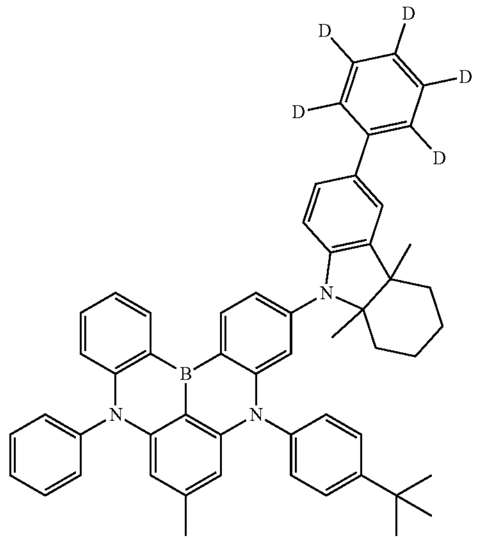

-continued
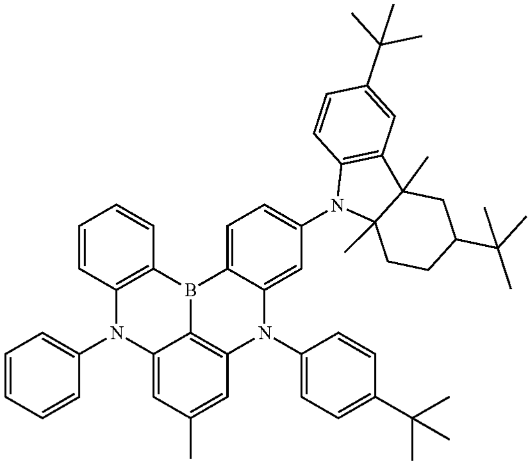
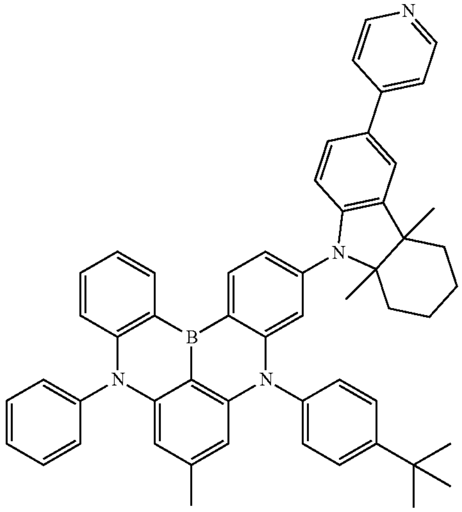
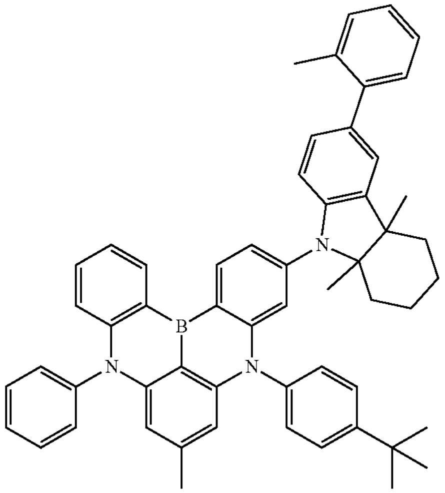
-continued
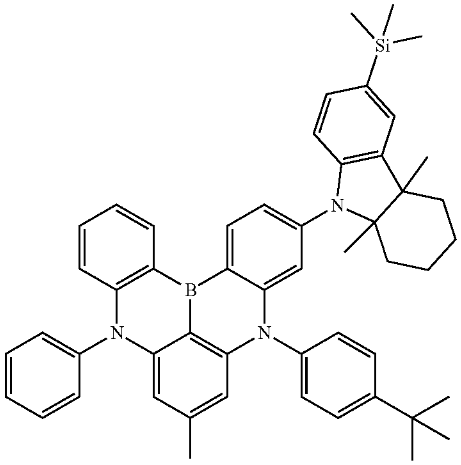
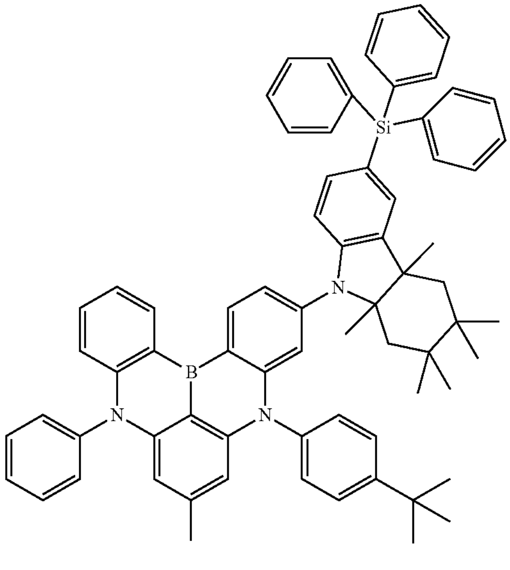
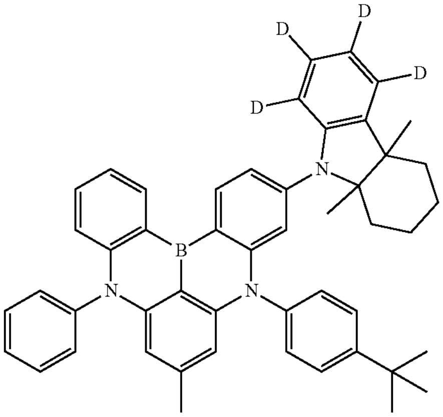

-continued
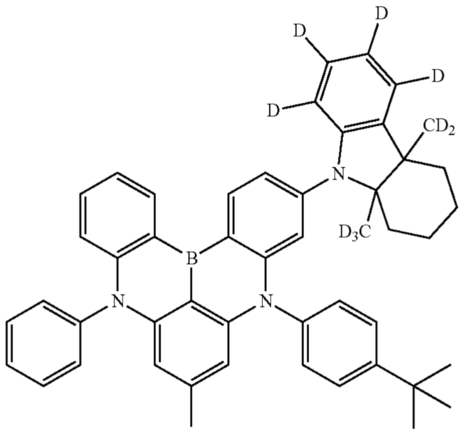
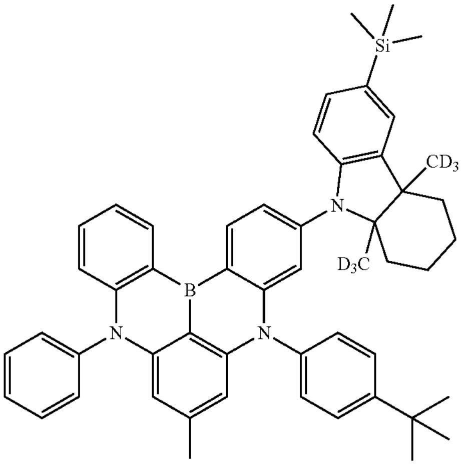
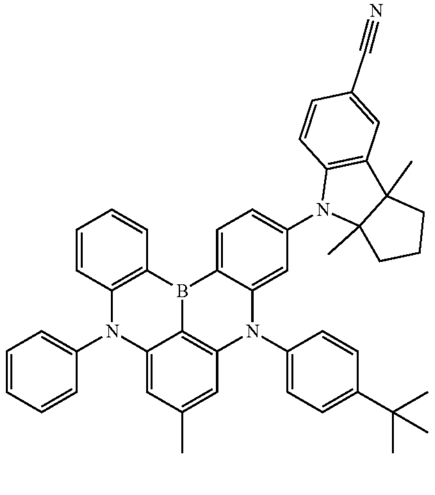
-continued
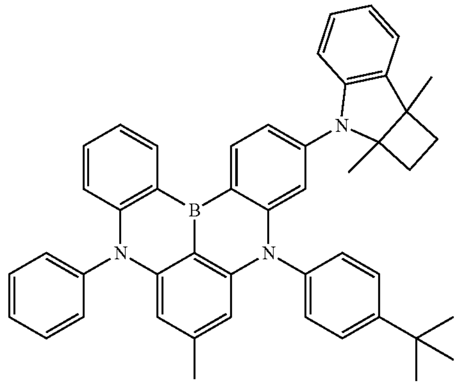
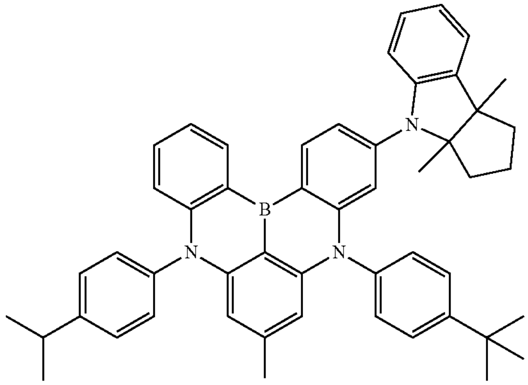
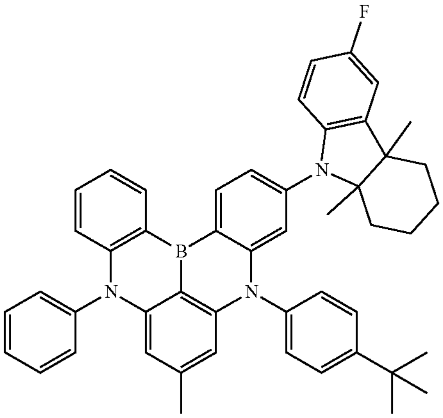
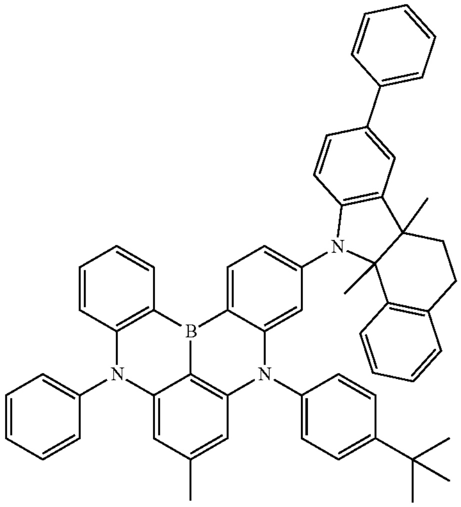

-continued
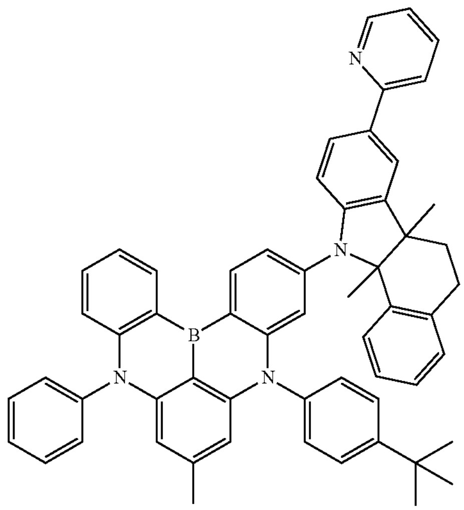
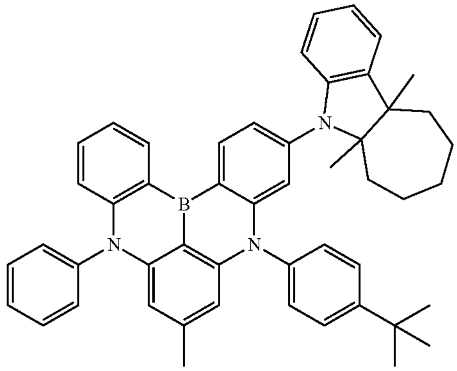
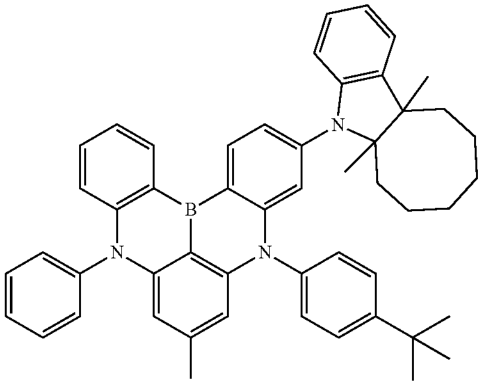
-continued
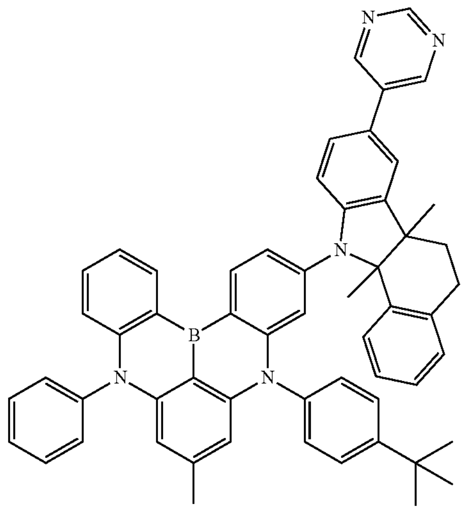
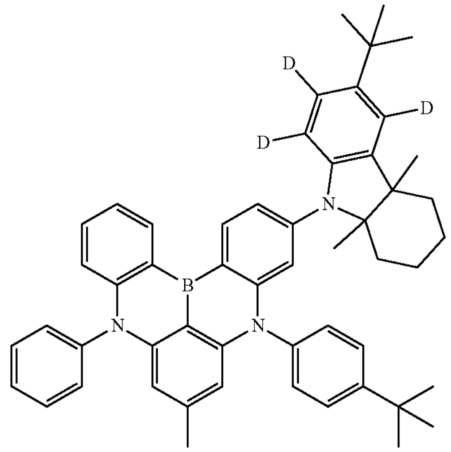
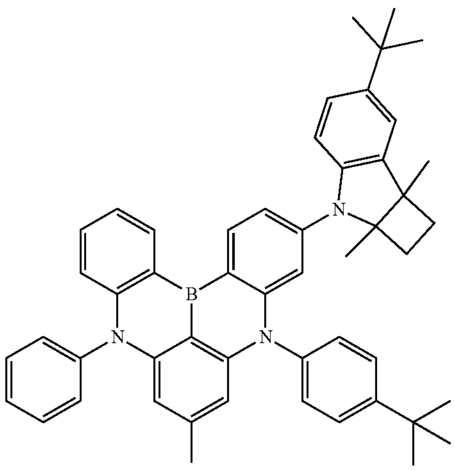

-continued
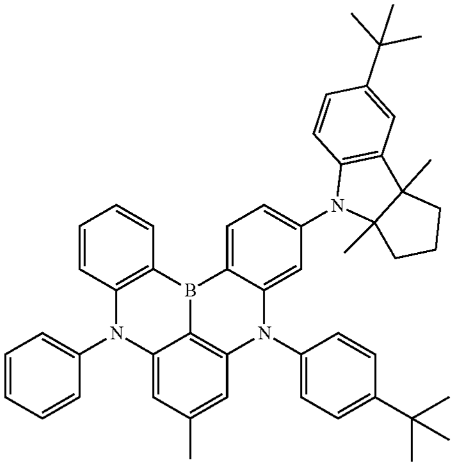
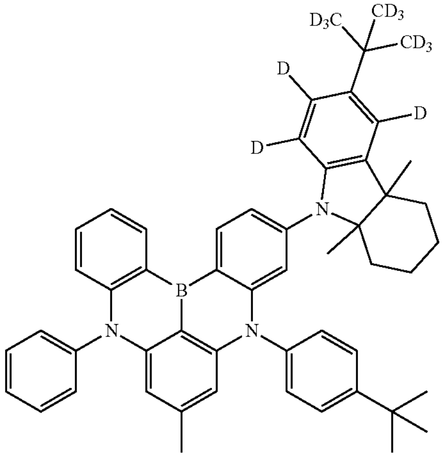
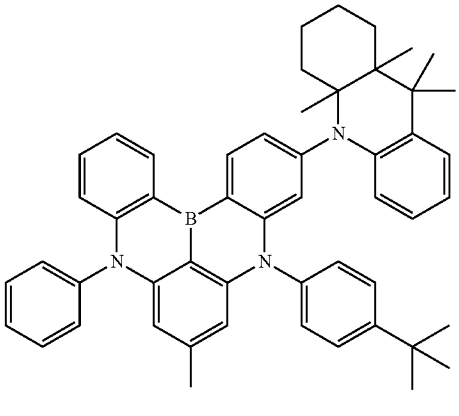
-continued
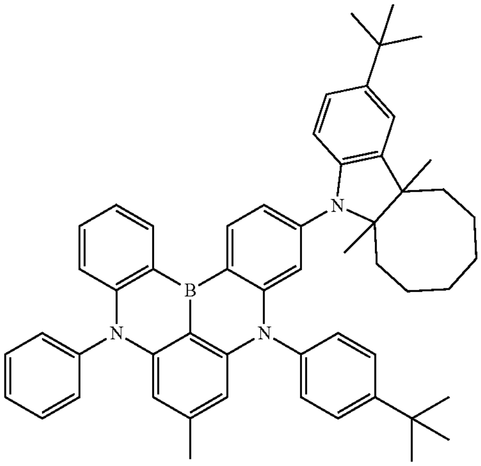
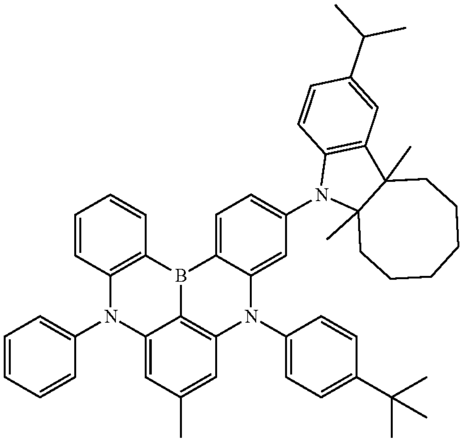
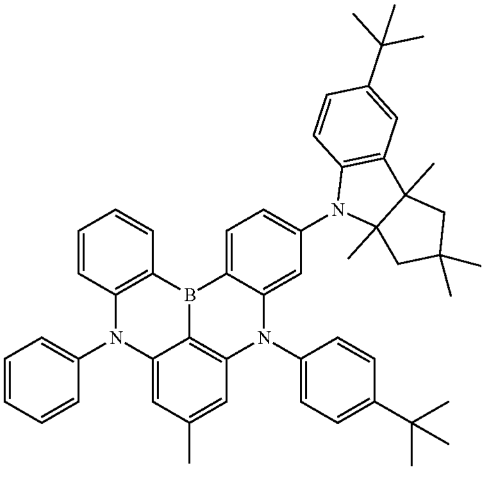

-continued
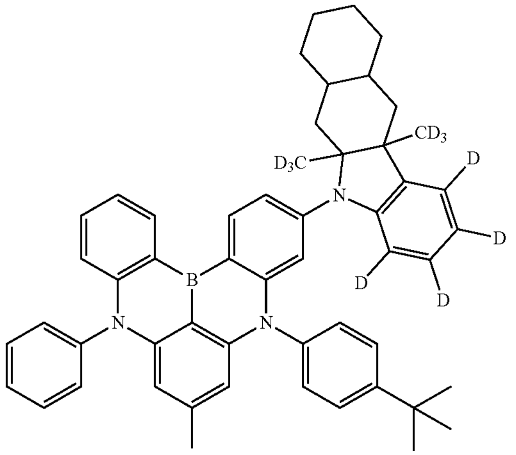
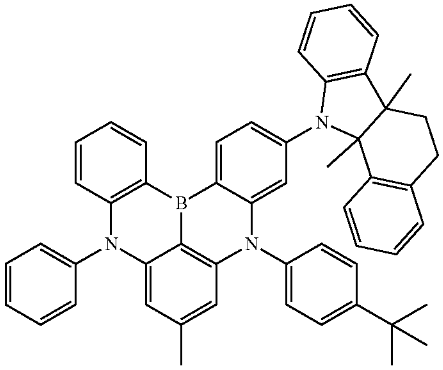
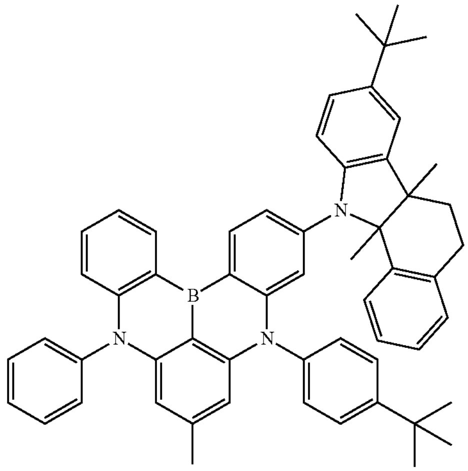
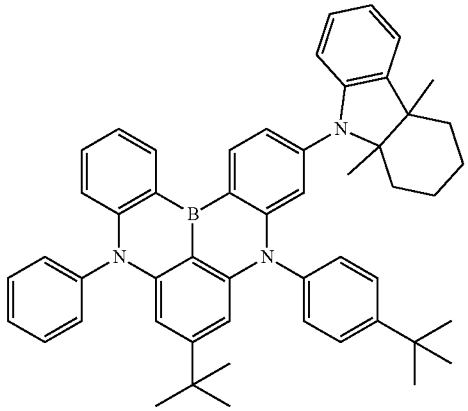
-continued
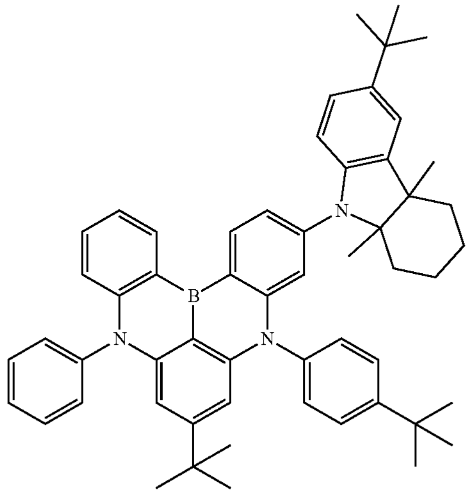
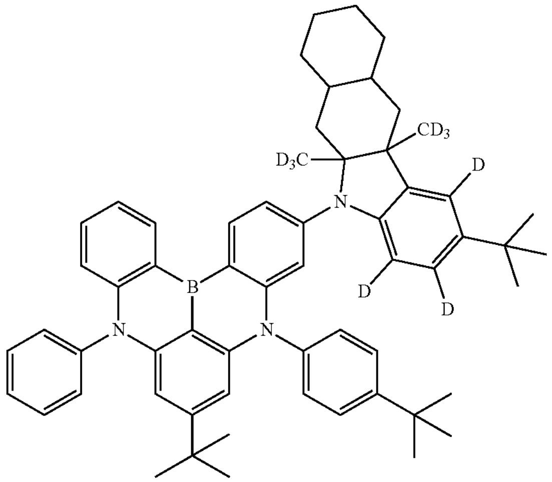
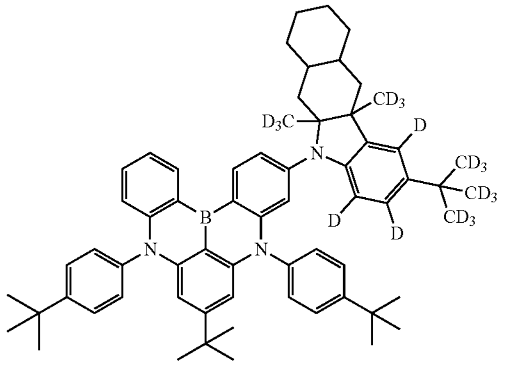

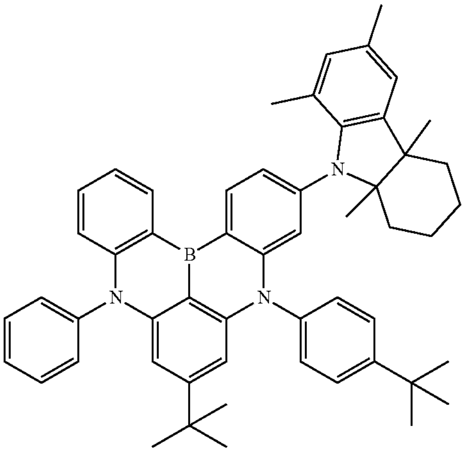
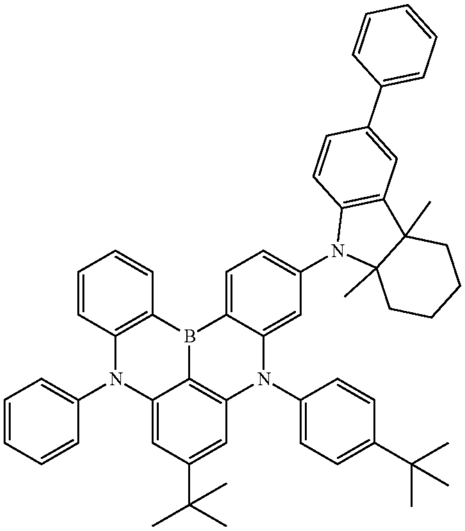
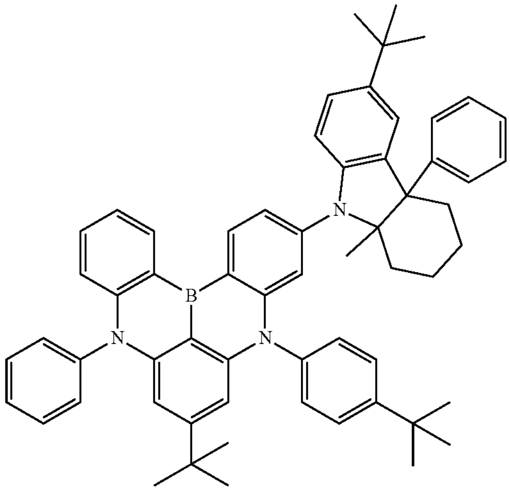
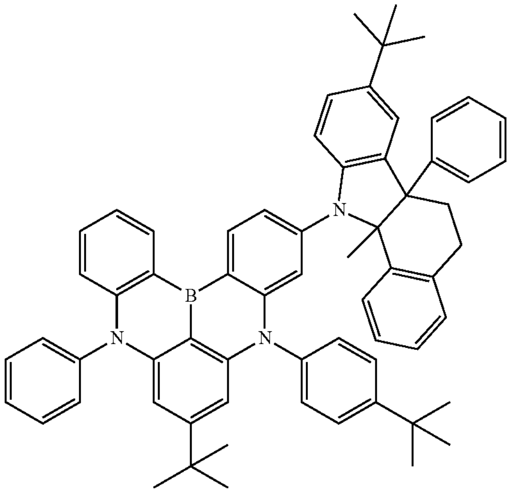
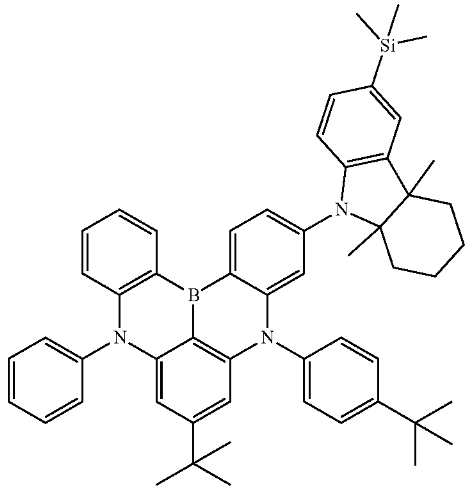
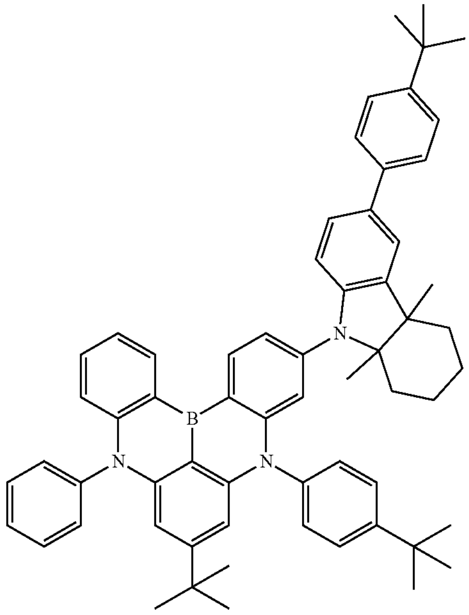

-continued
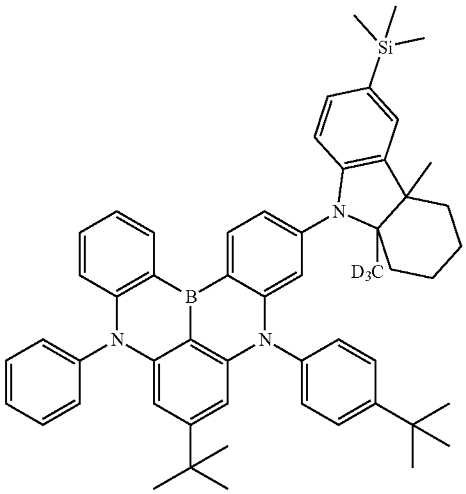
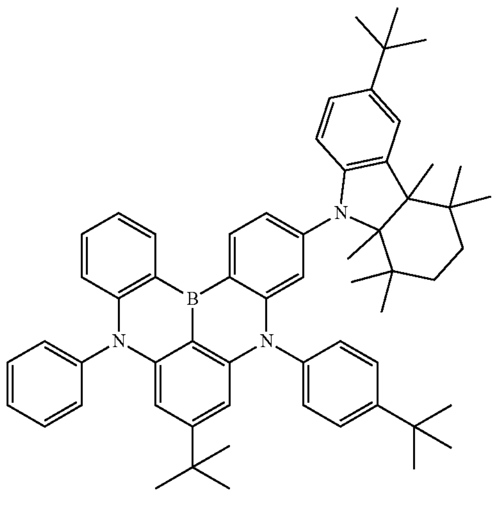
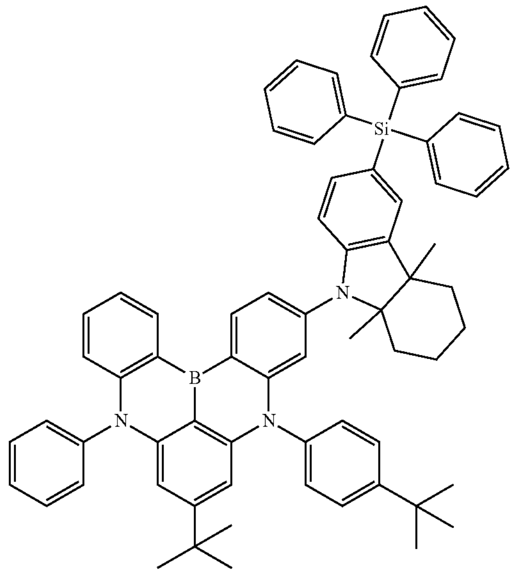
-continued
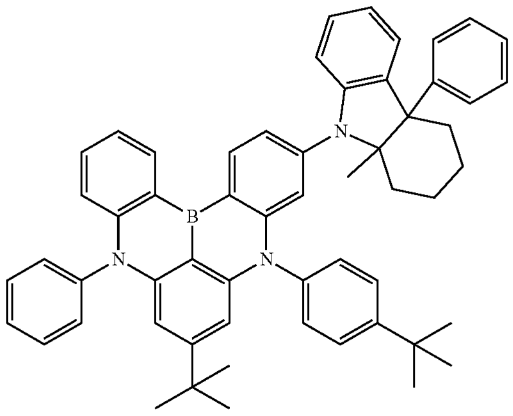
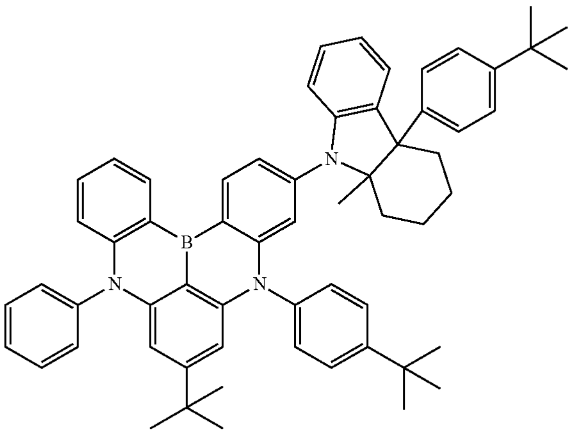
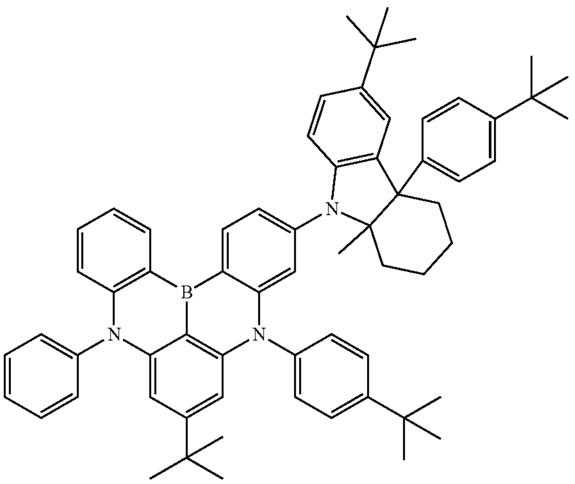

-continued
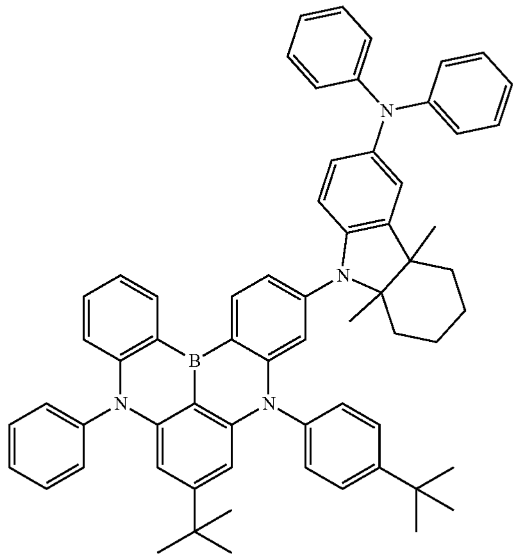
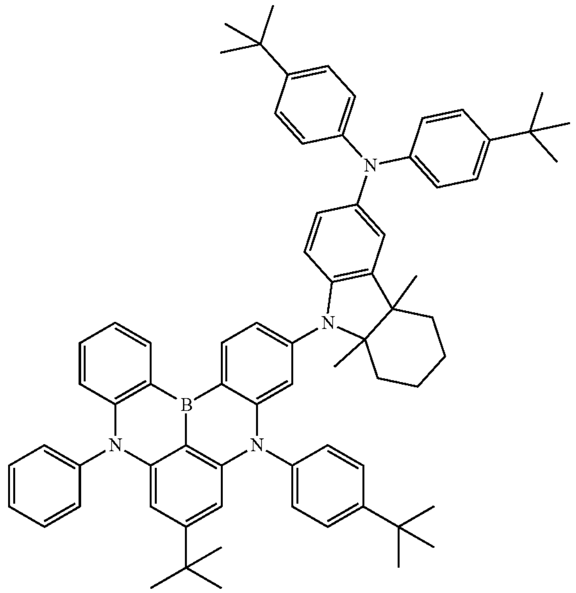
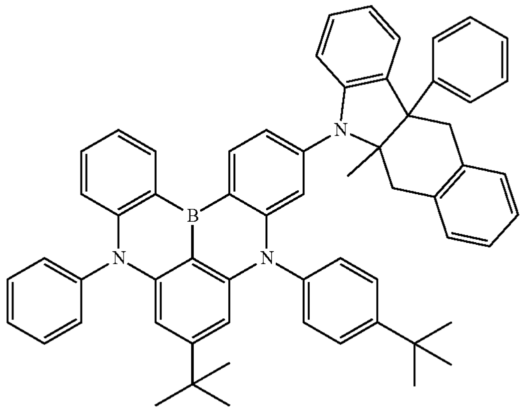
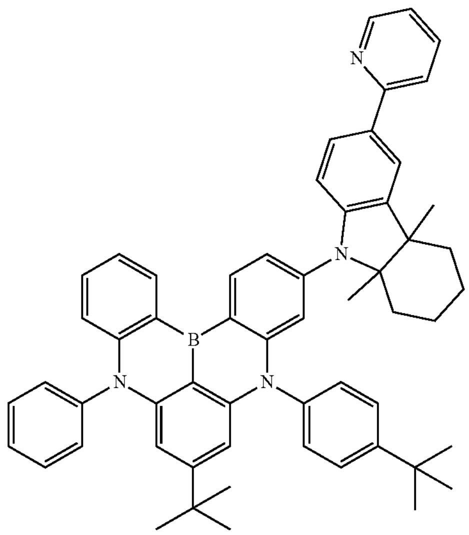
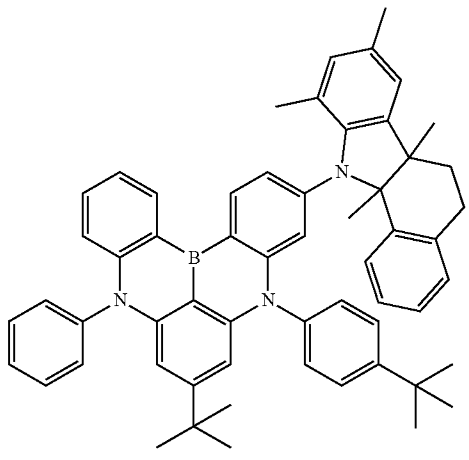
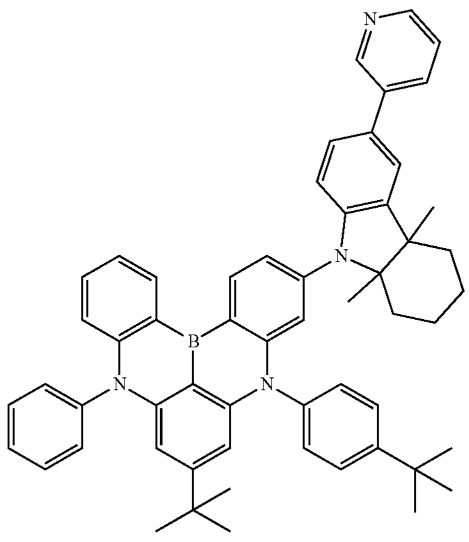
-continued -continued
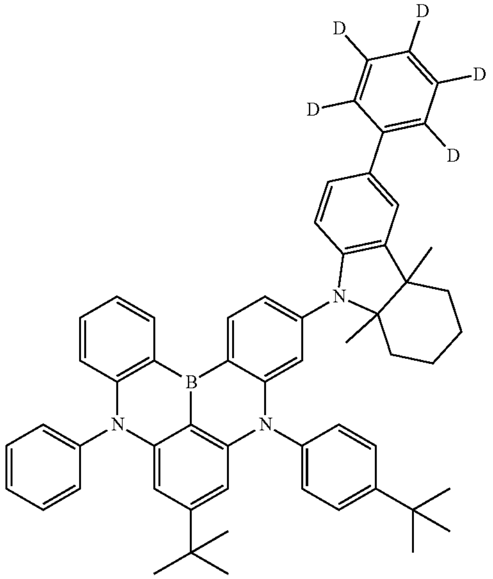
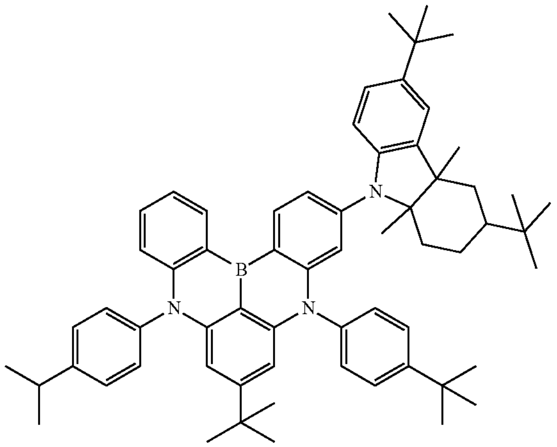
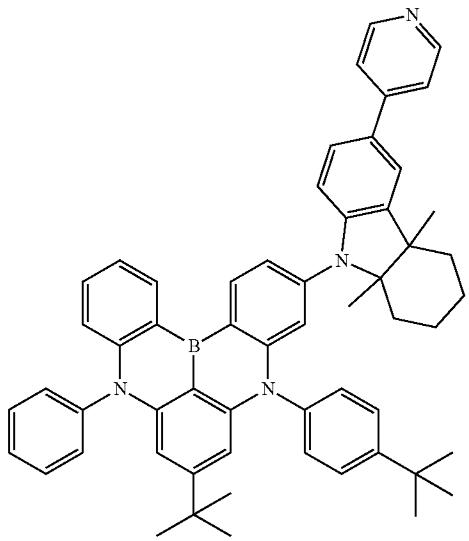
-continued
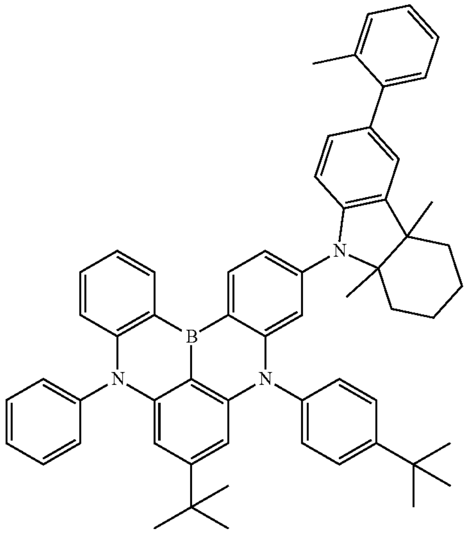
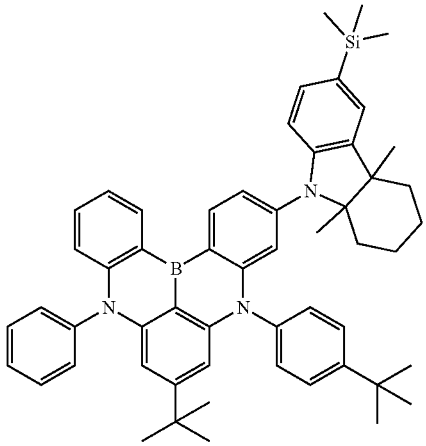
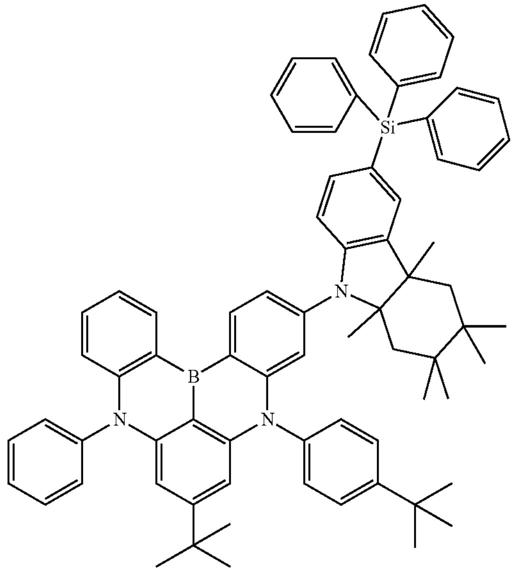

-continued
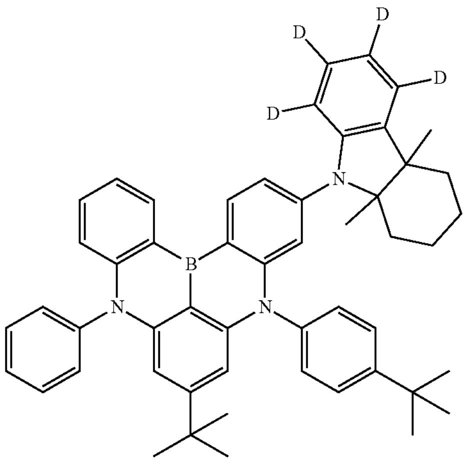
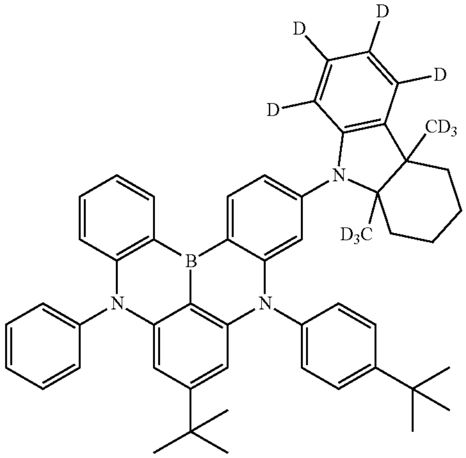
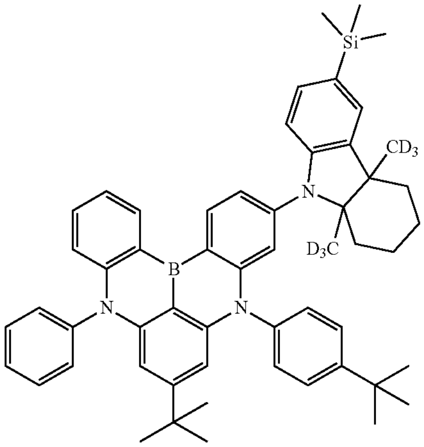
-continued
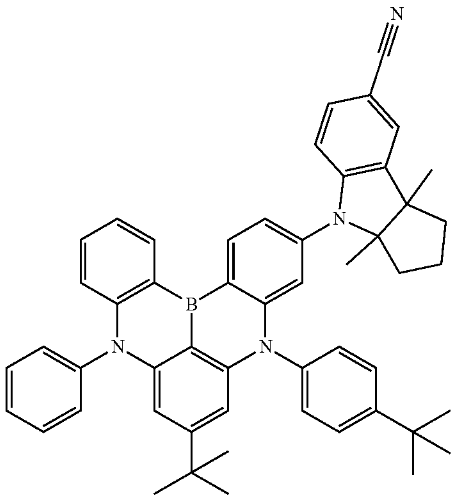
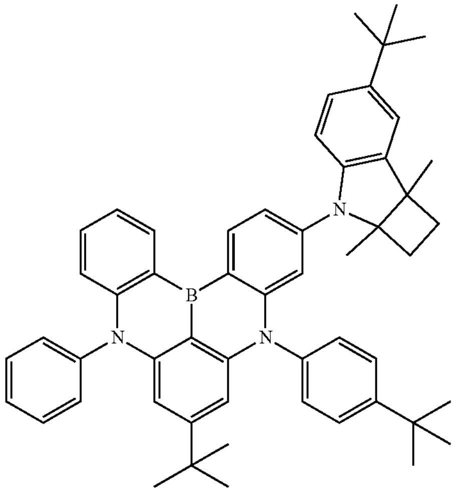
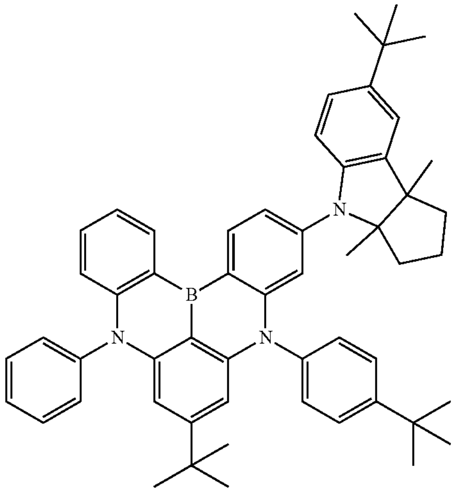

-continued
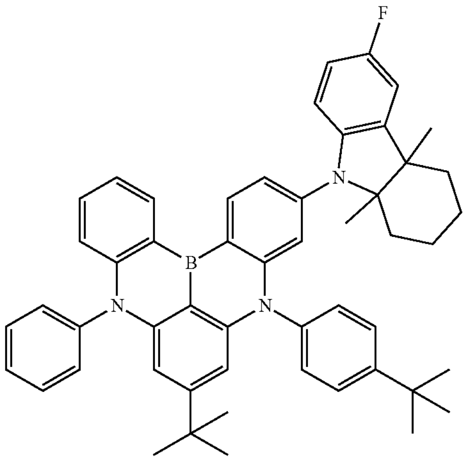
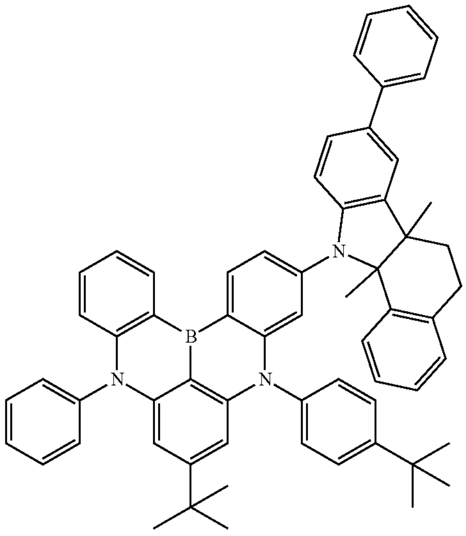
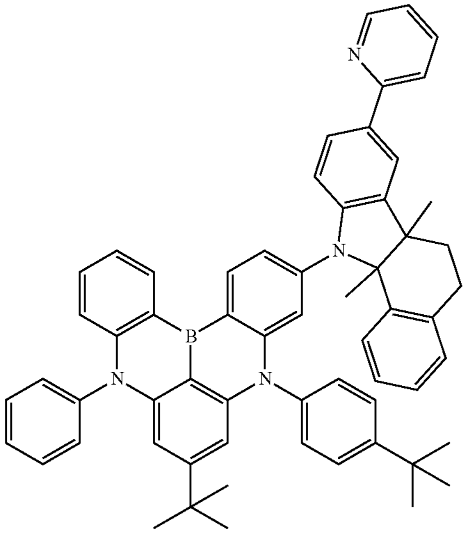
-continued
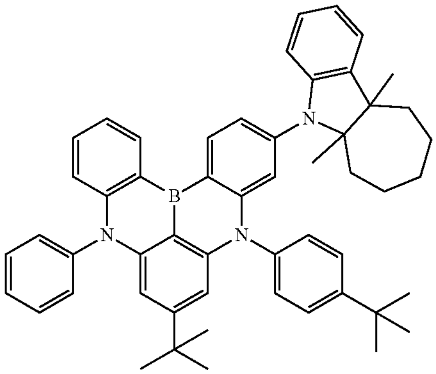
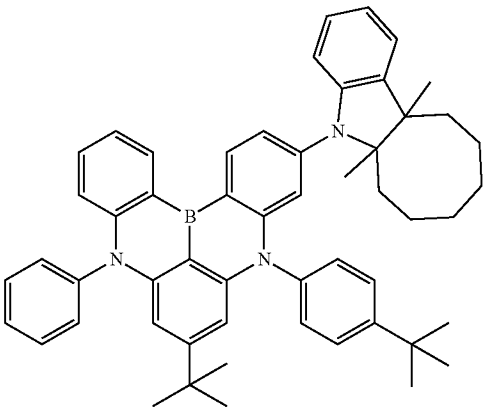
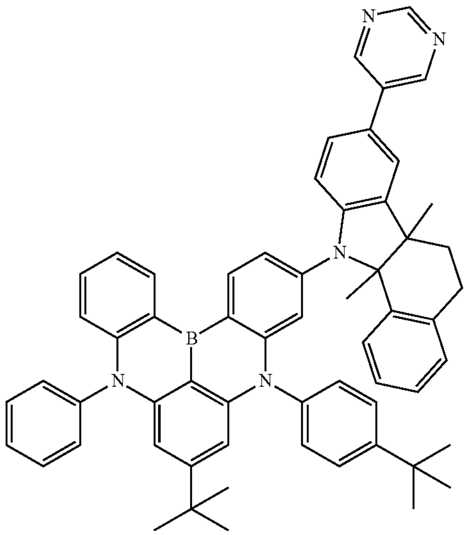

-continued
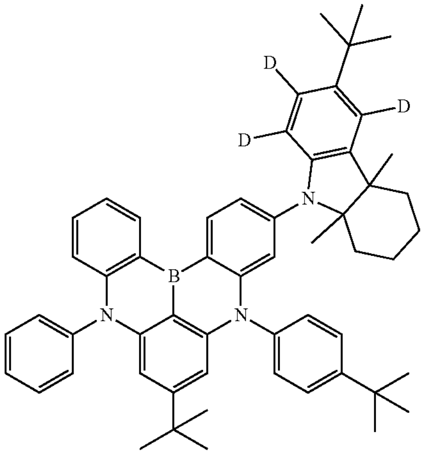
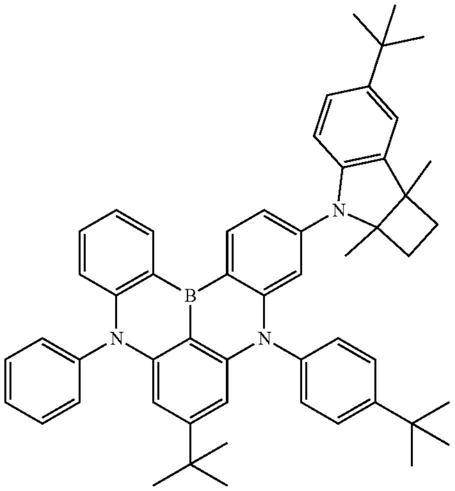
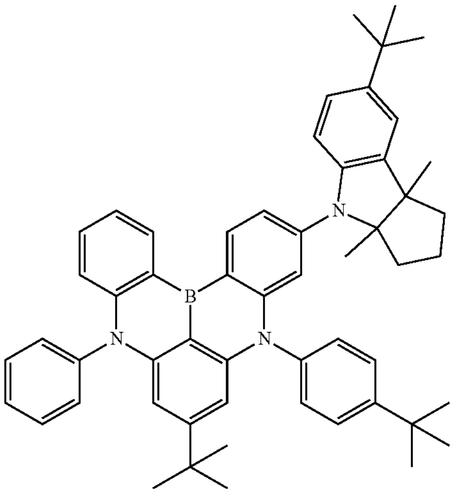
-continued
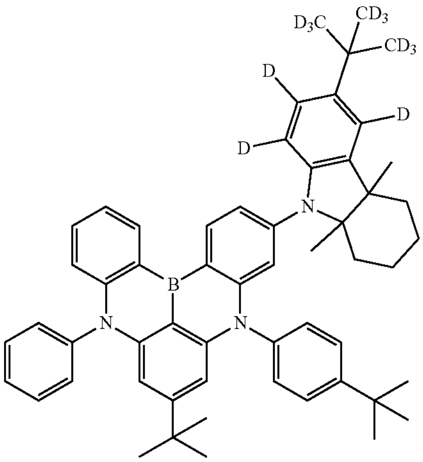
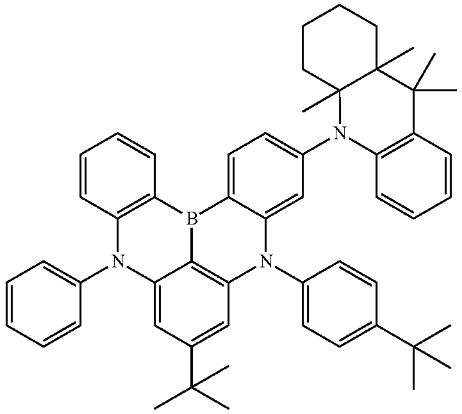
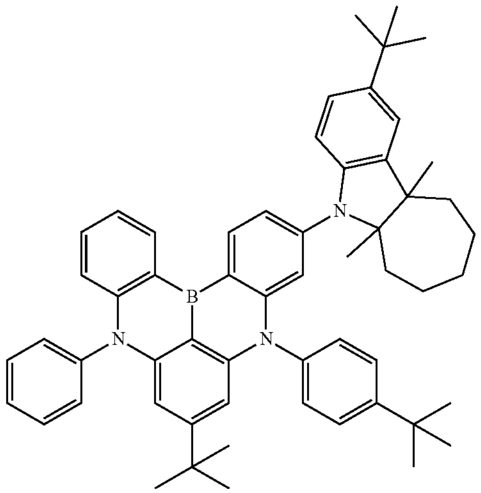

-continued
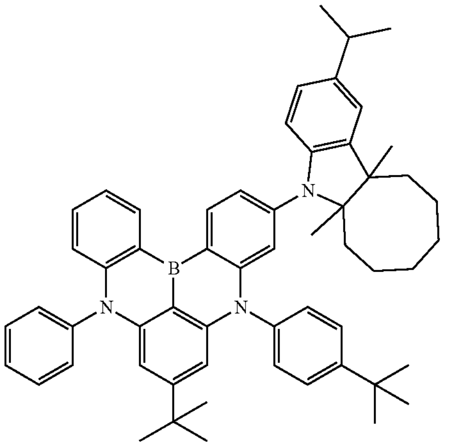
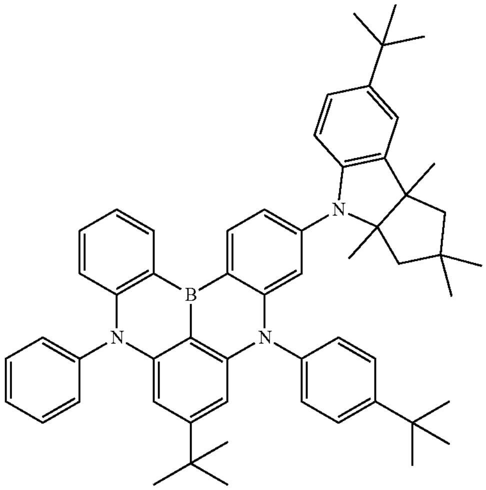
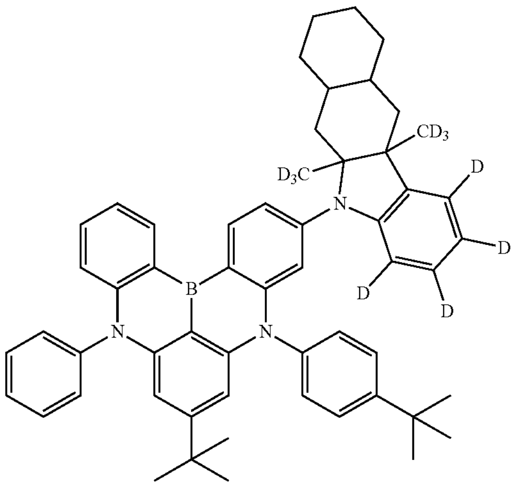
-continued
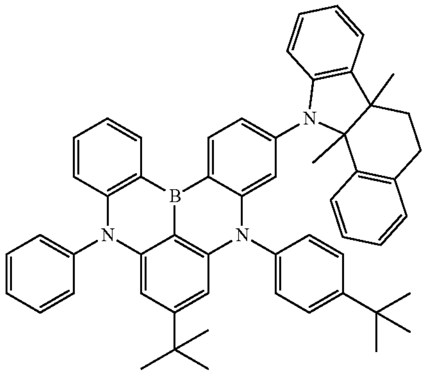
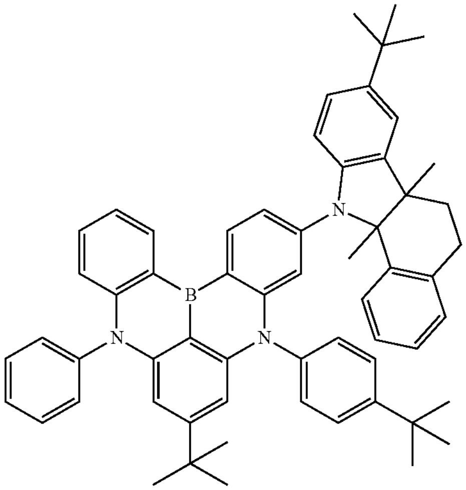
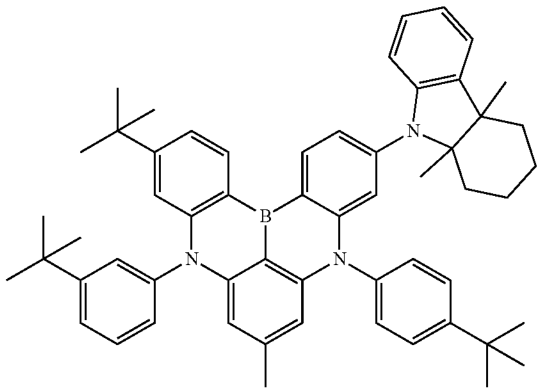
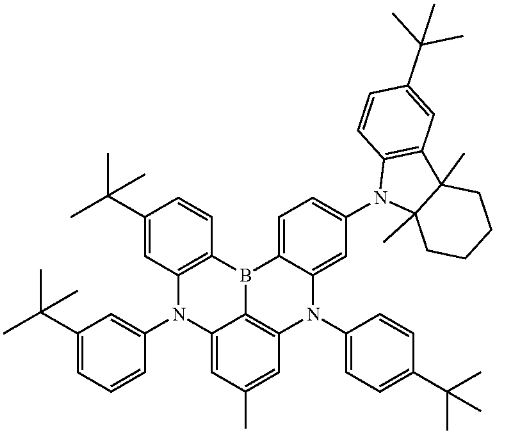

-continued
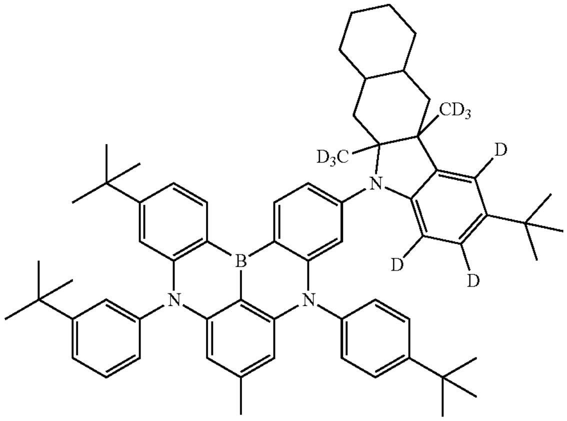
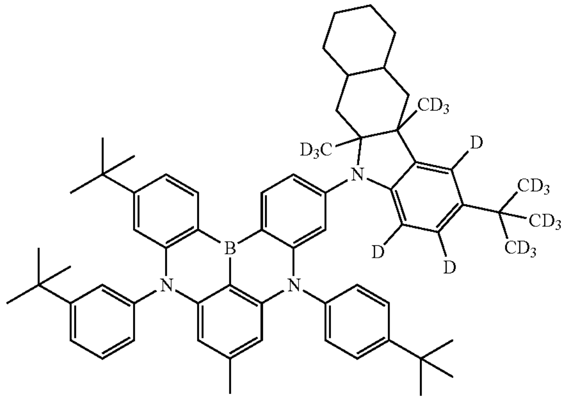
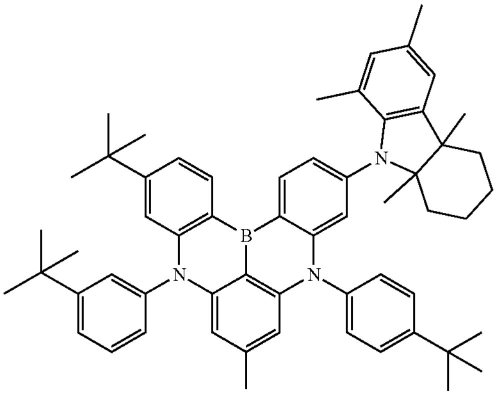
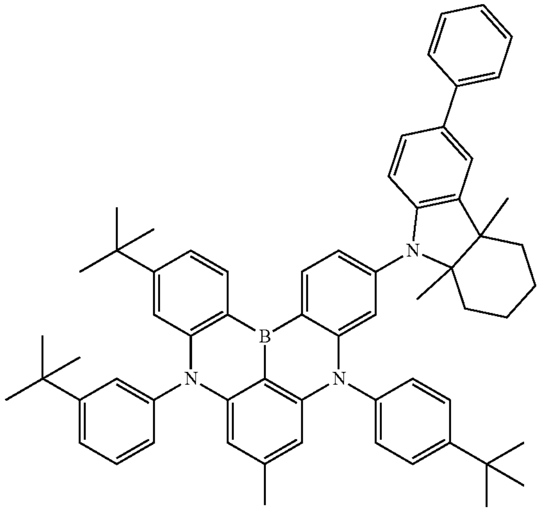
-continued
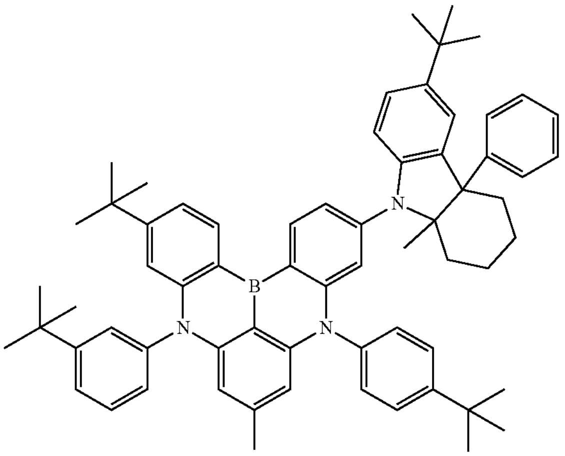
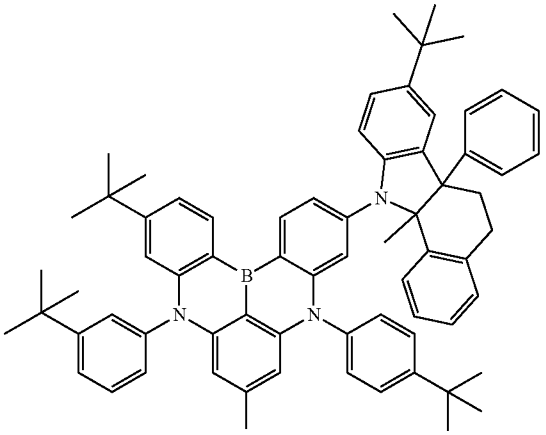
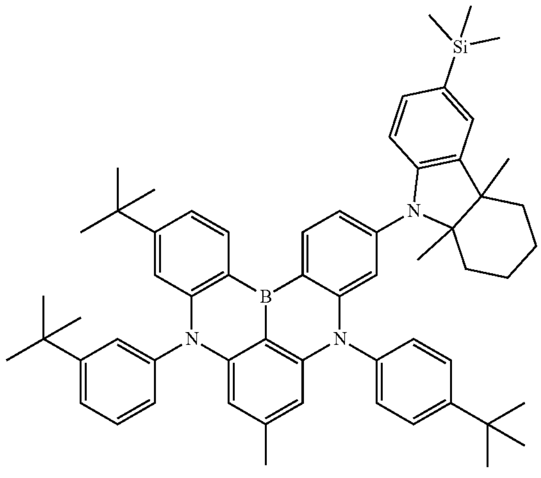

-continued
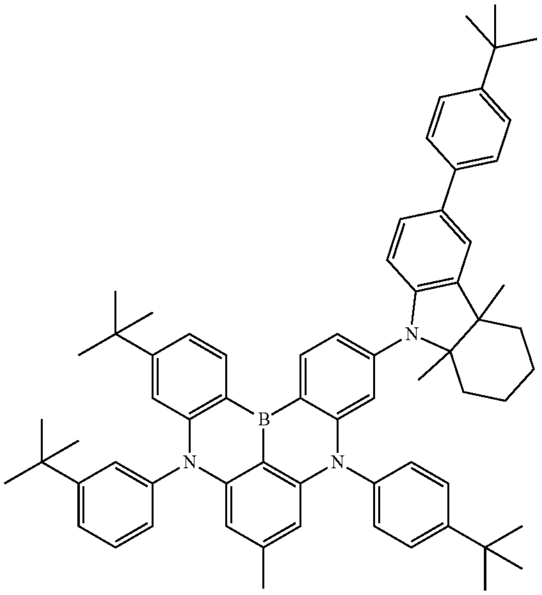
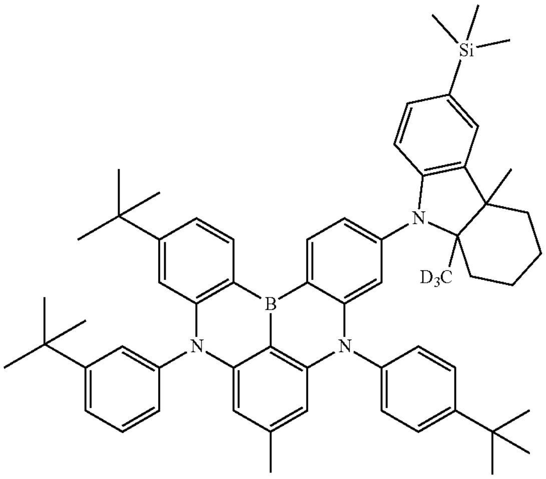
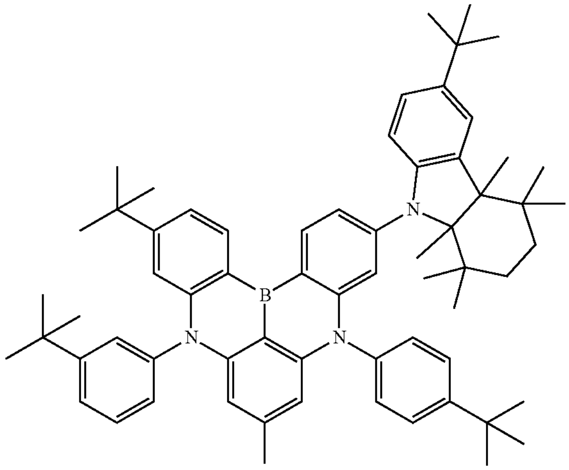
-continued
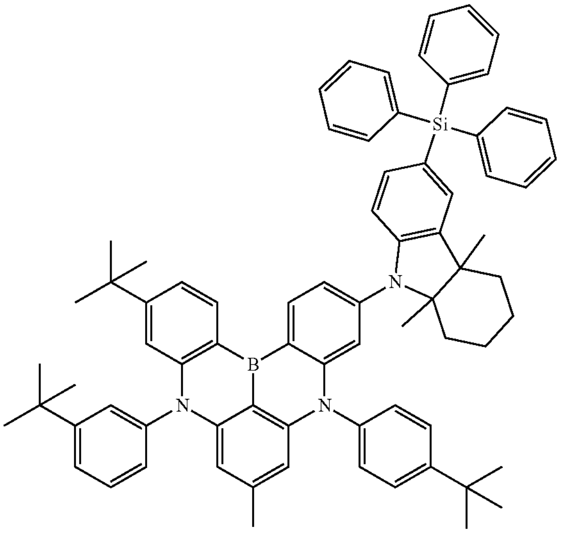
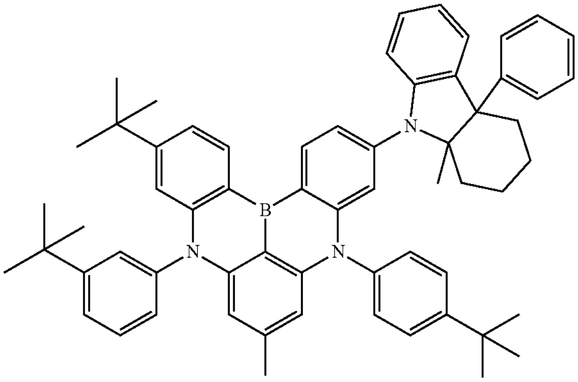
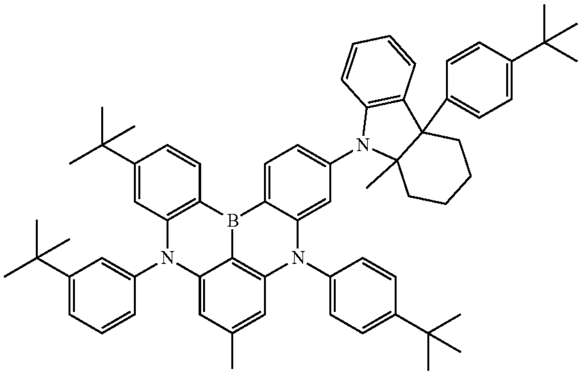
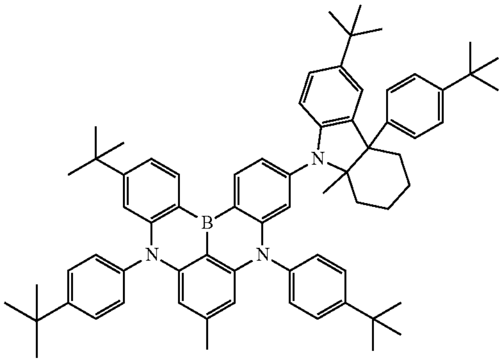

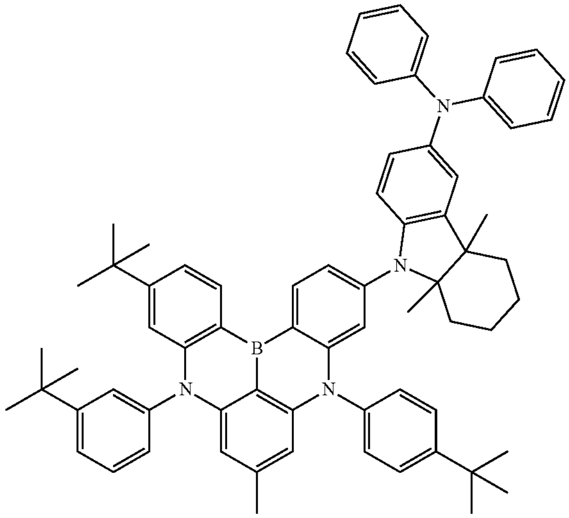
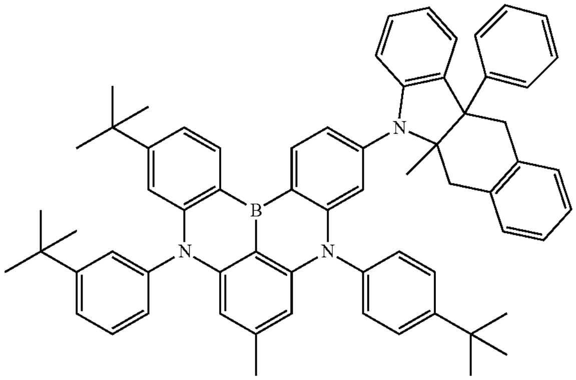
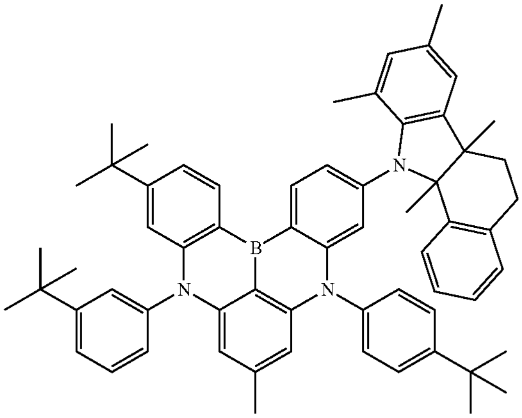
-continued
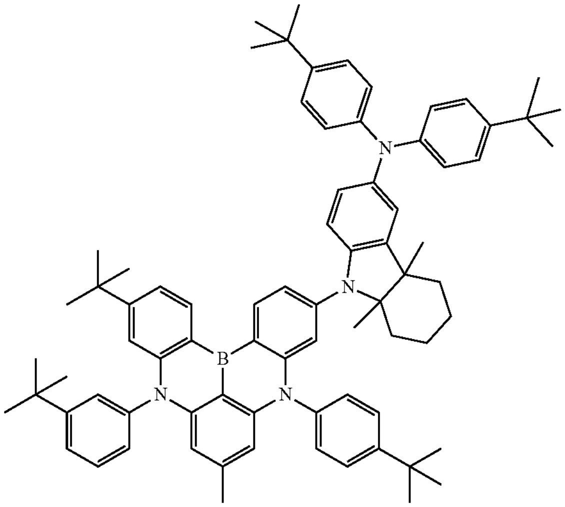
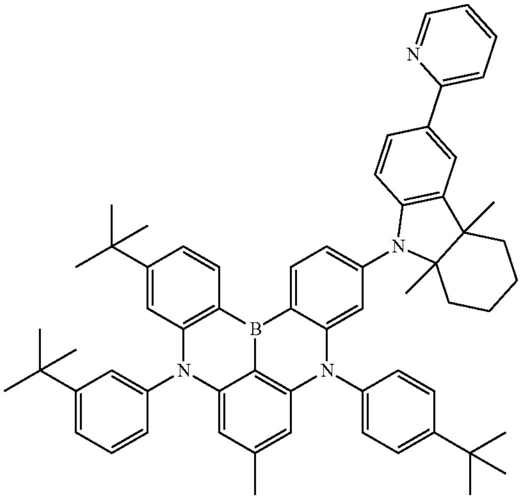
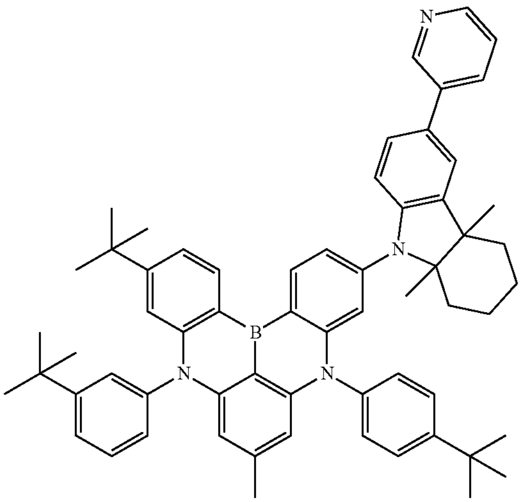

-continued
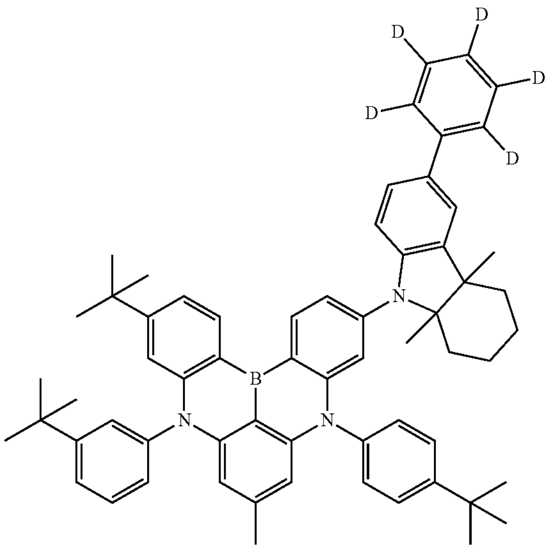
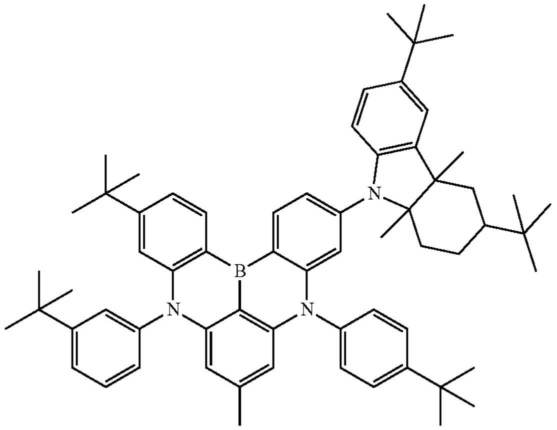
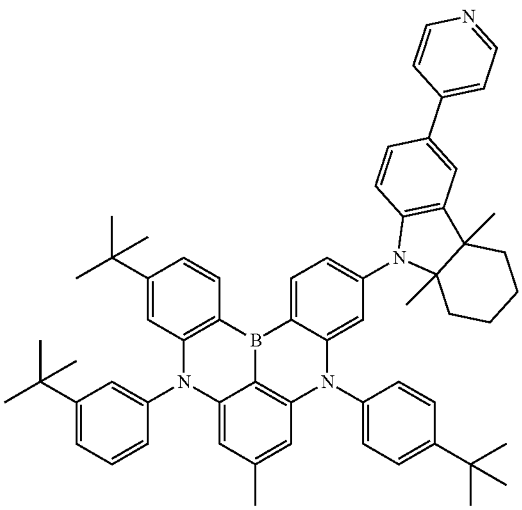
-continued
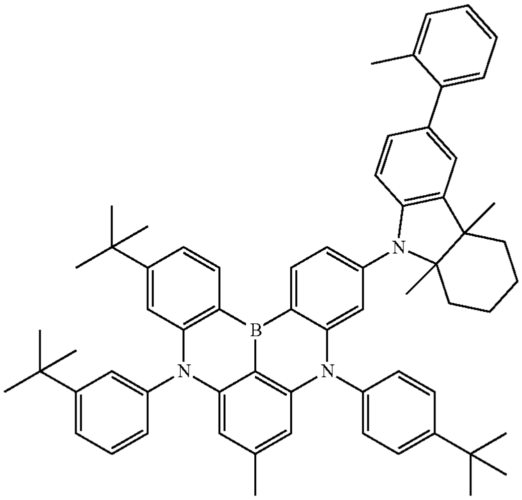
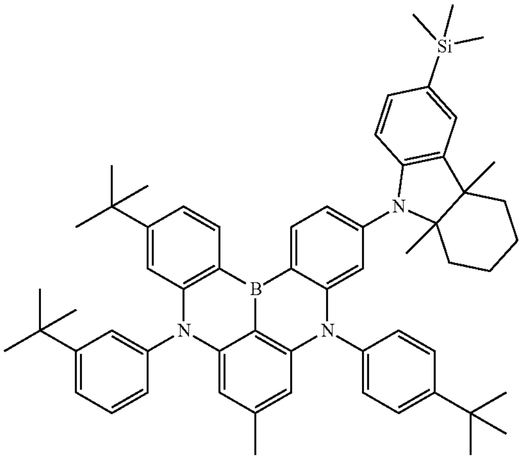
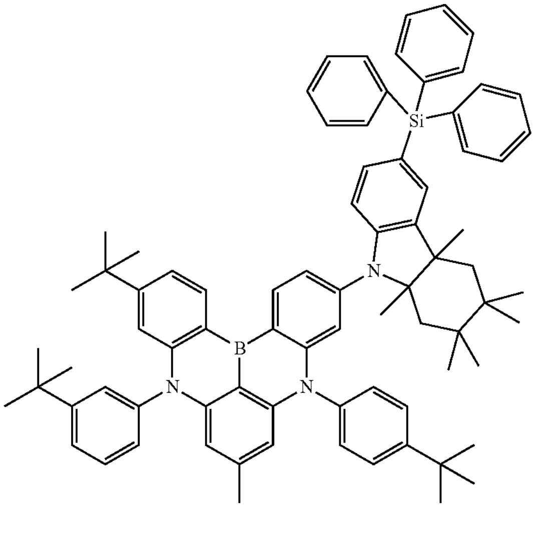

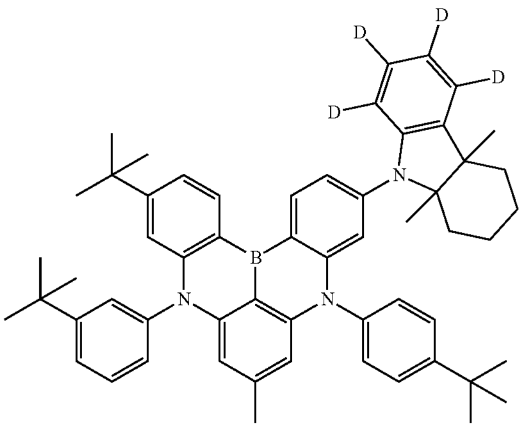
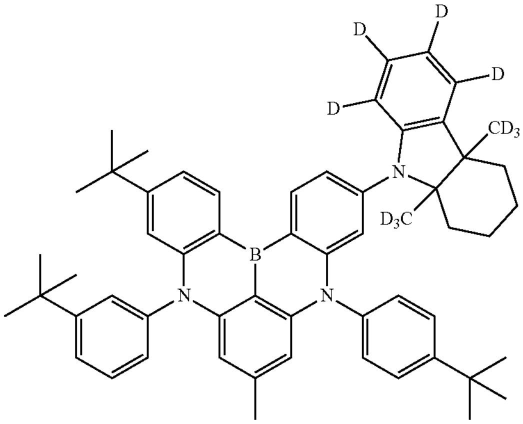
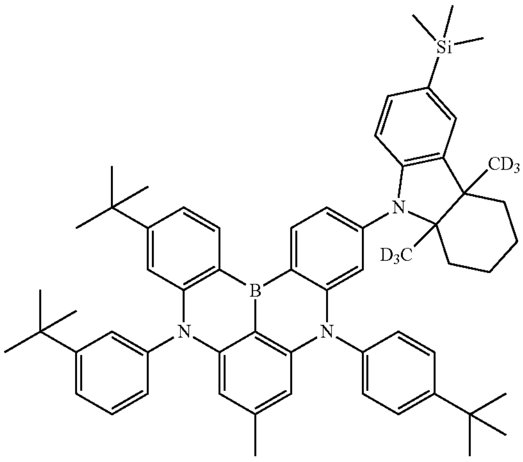
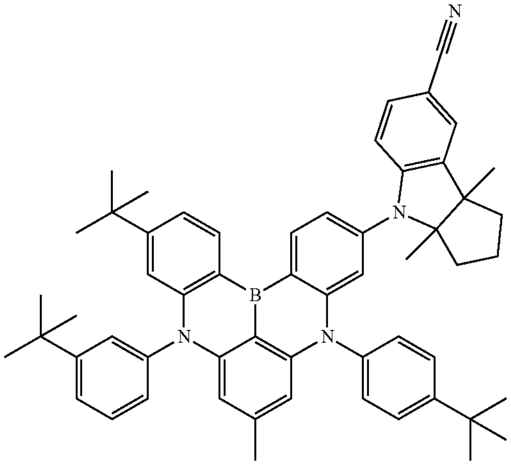
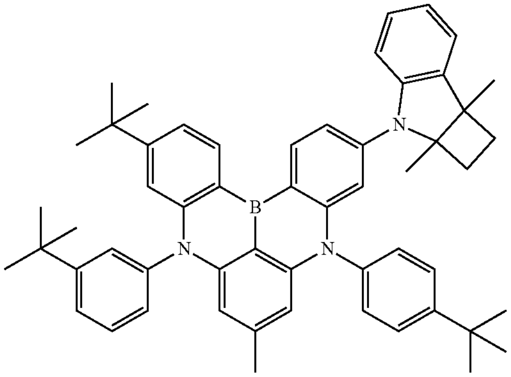
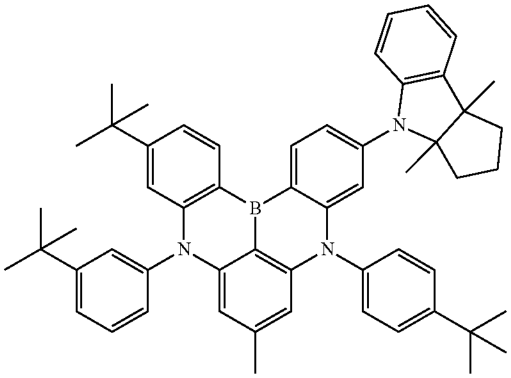
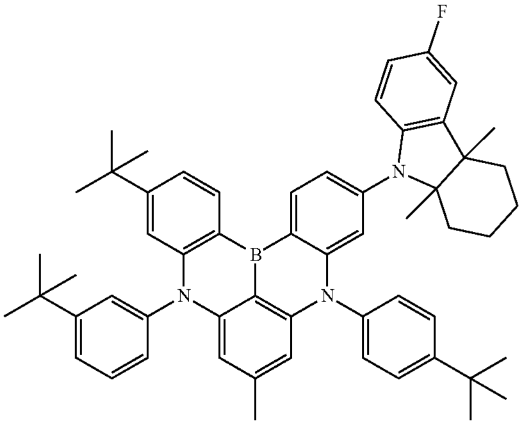

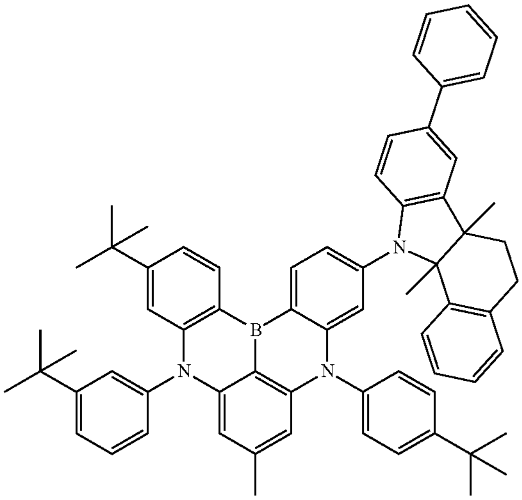
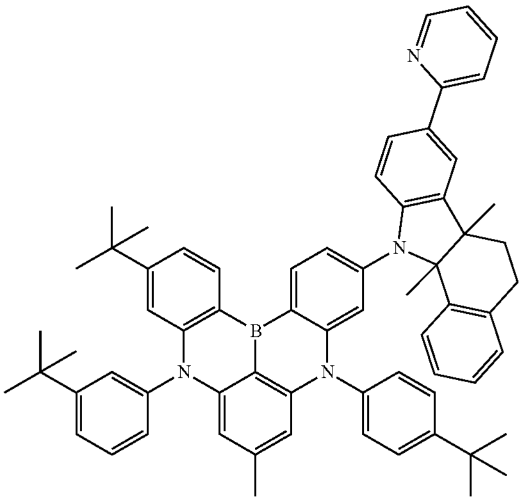
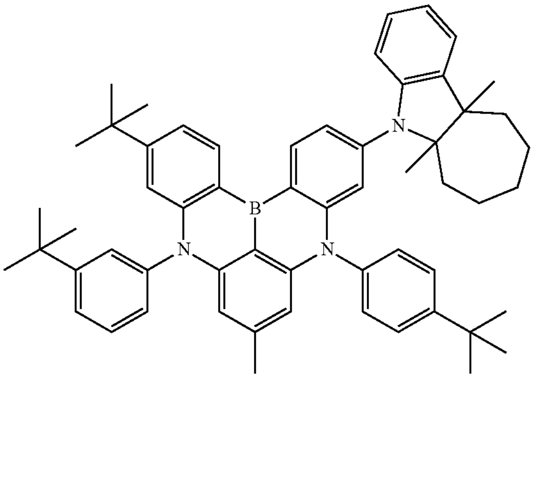
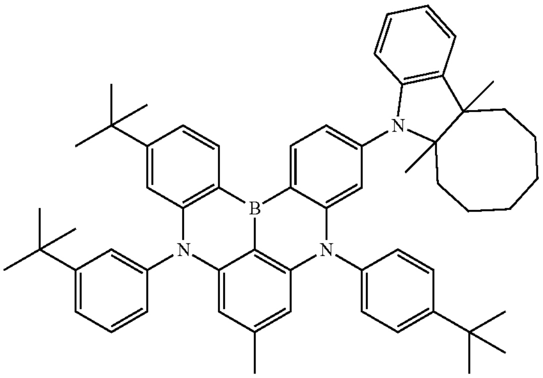
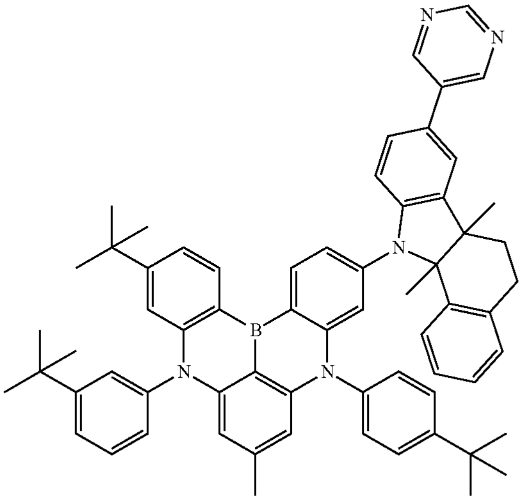
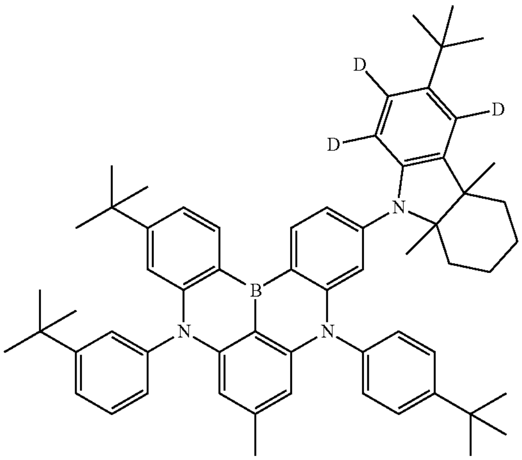

-continued
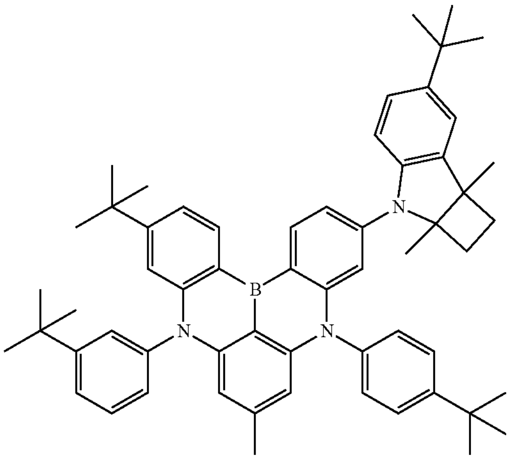
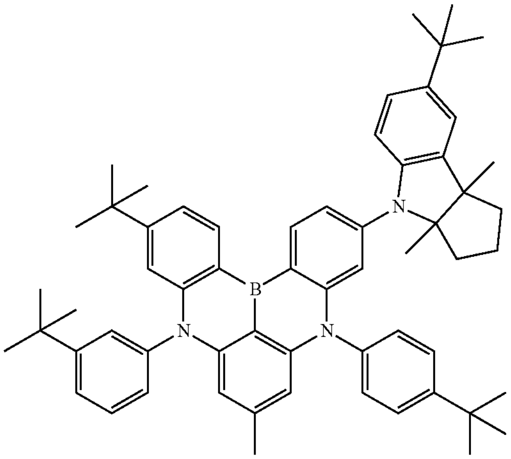
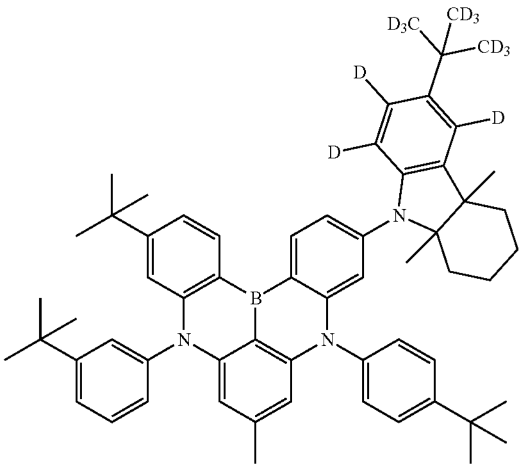
-continued
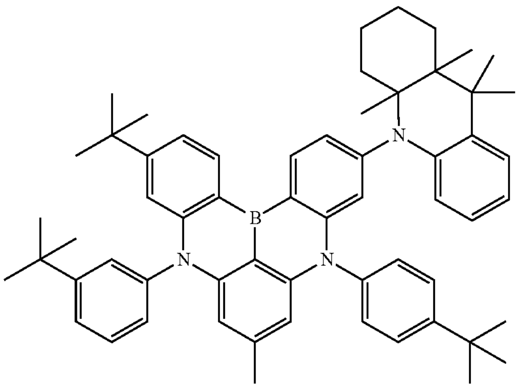
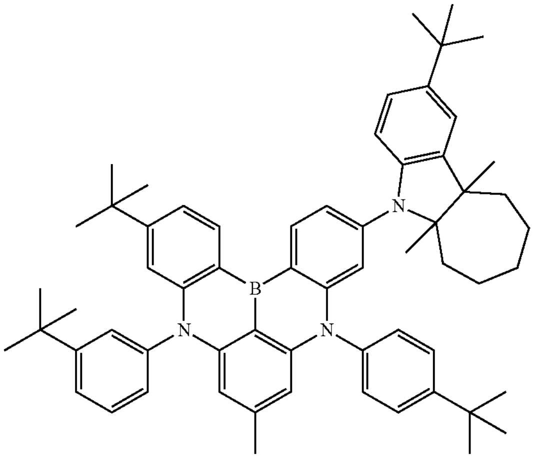
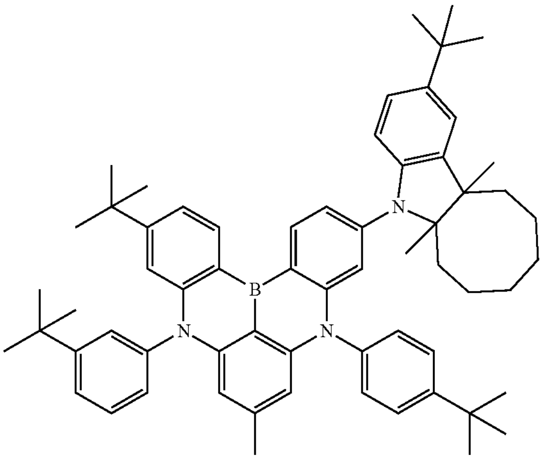

-continued
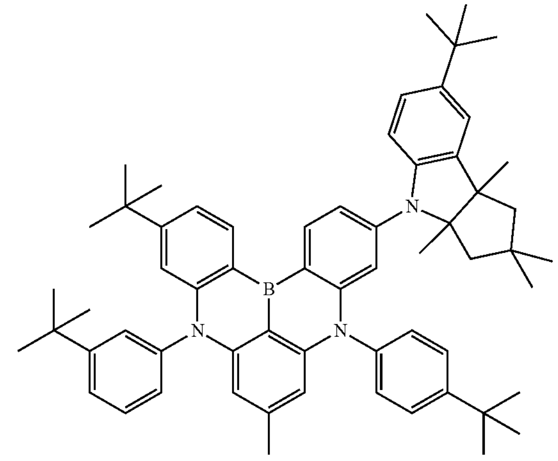
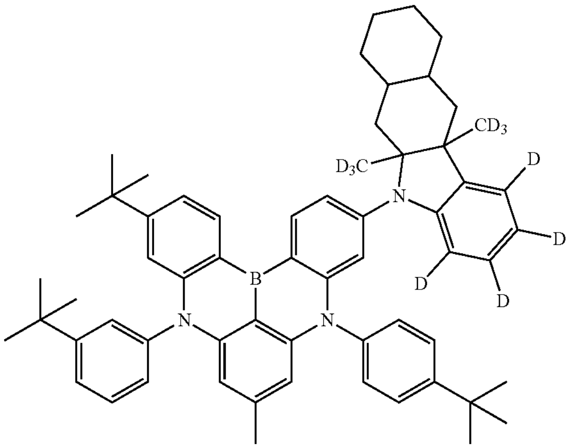
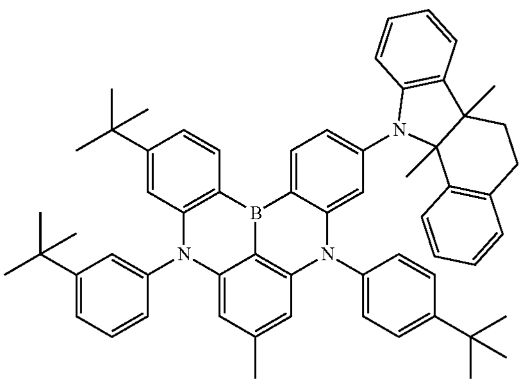
-continued
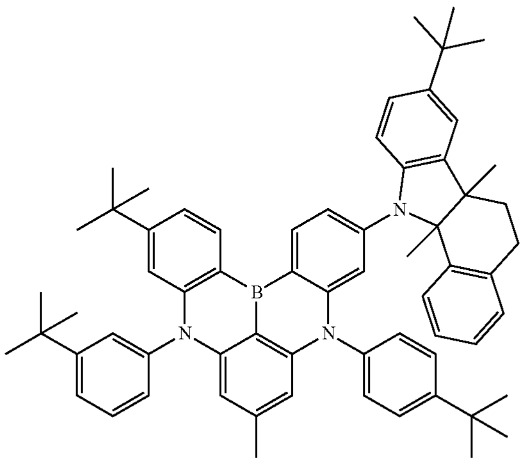
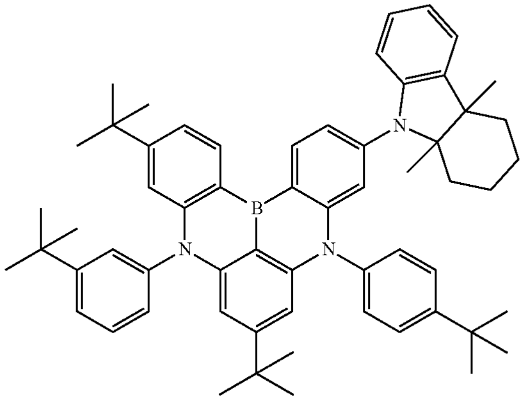
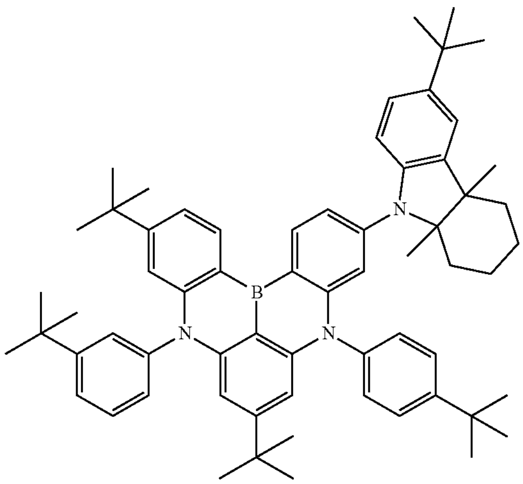

-continued
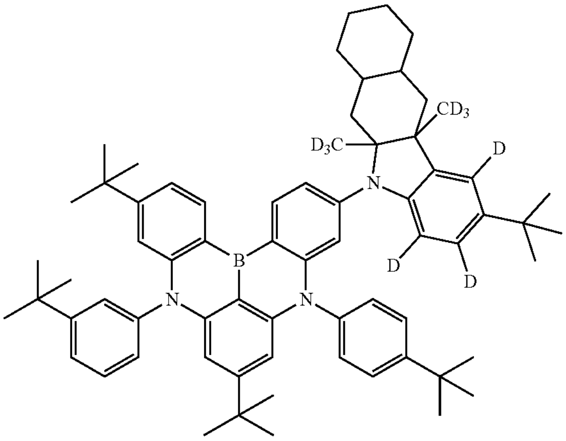
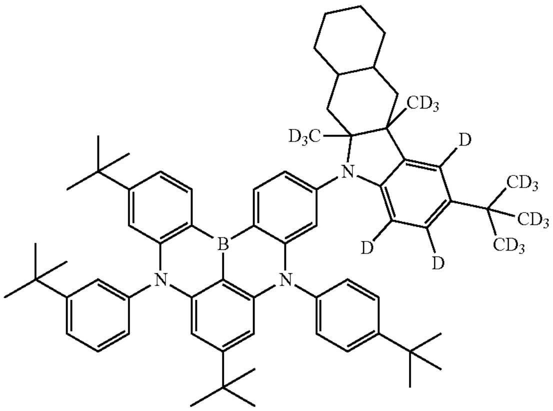
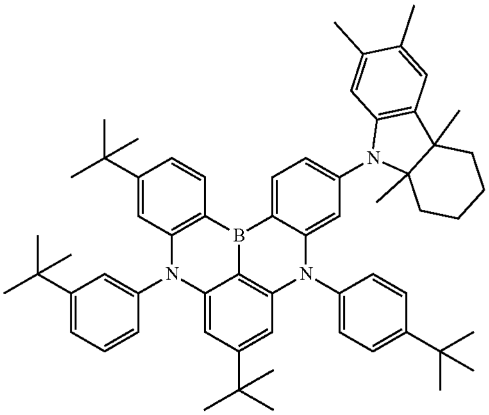
-continued
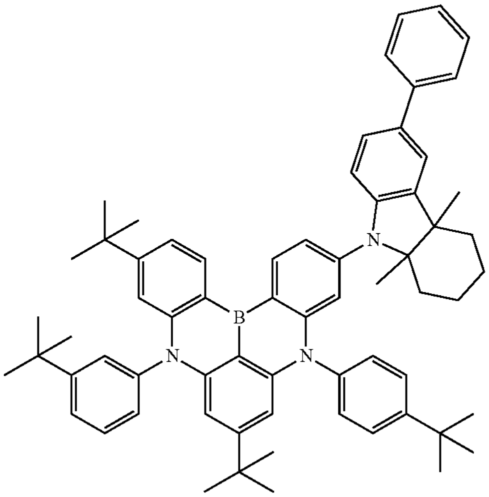
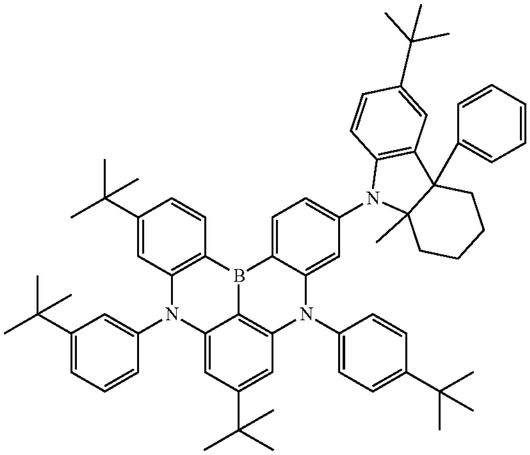
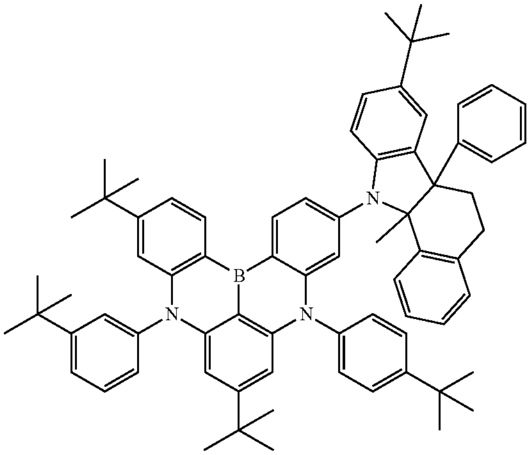

-continued
-continued
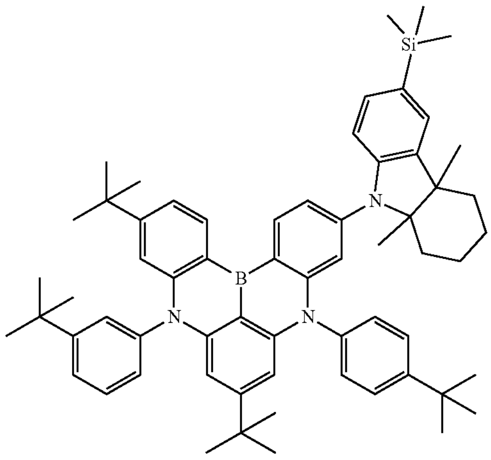
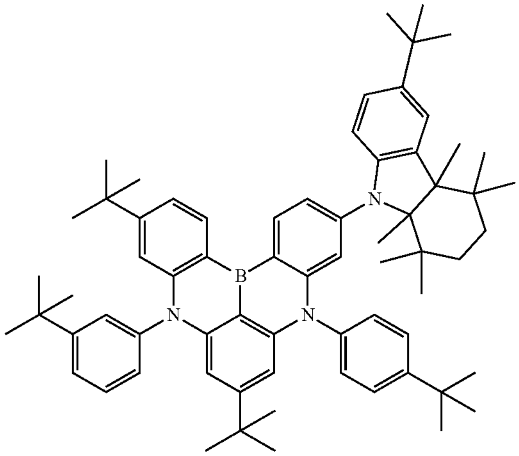
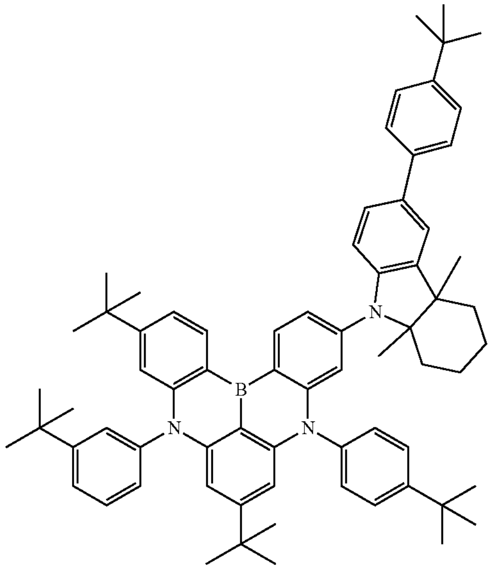
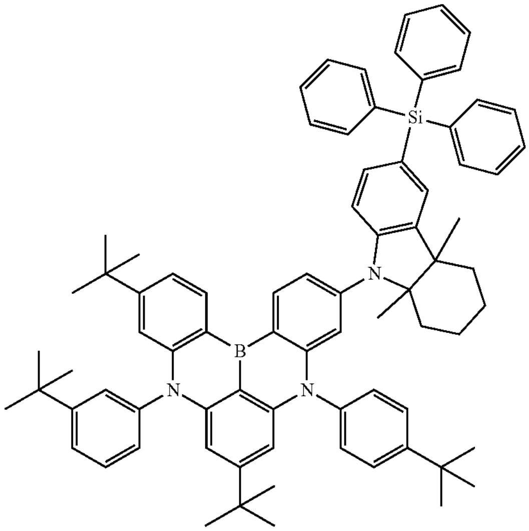
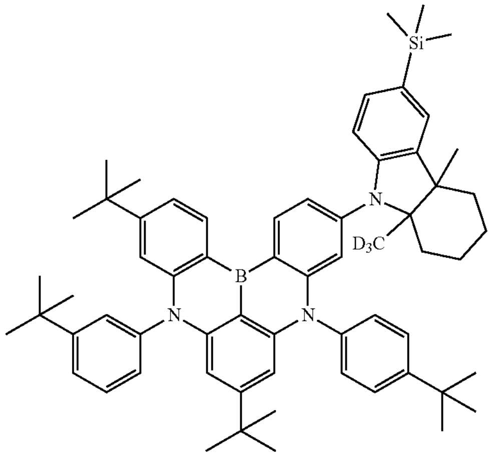
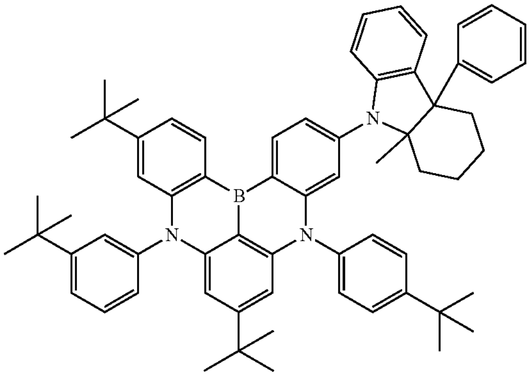

-continued
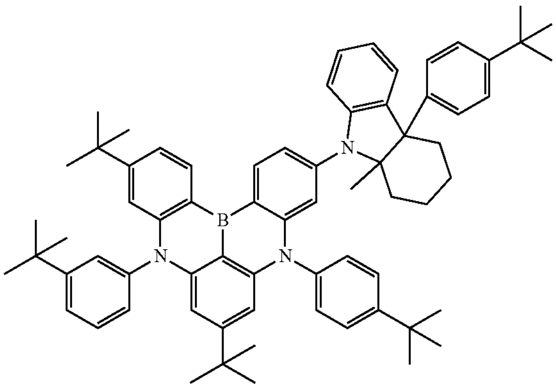
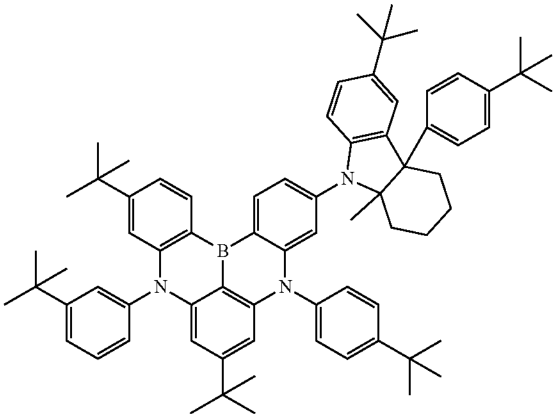
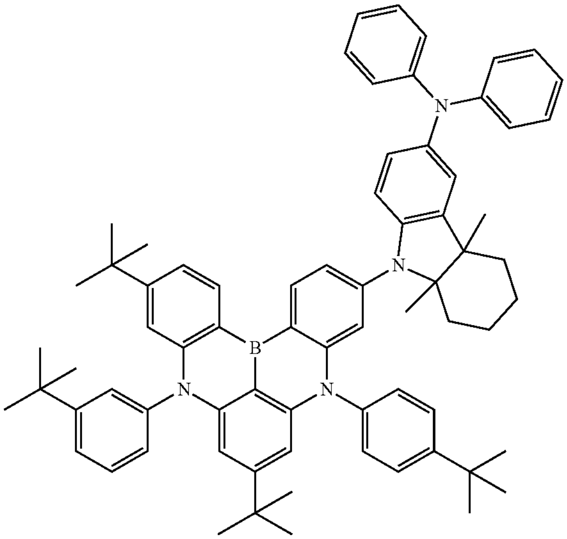
-continued
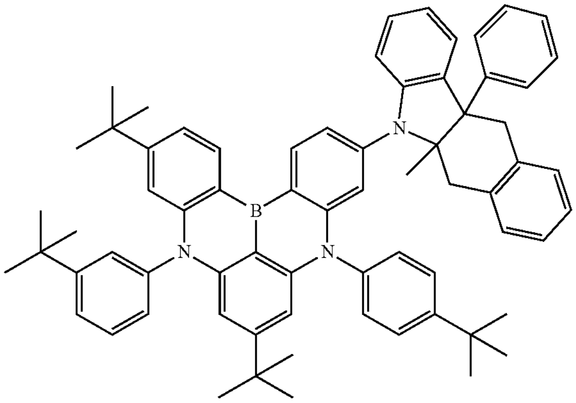
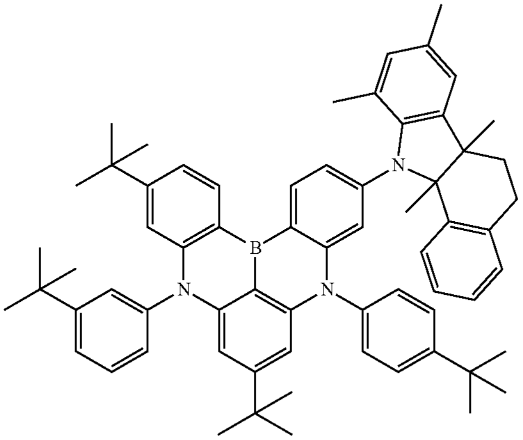
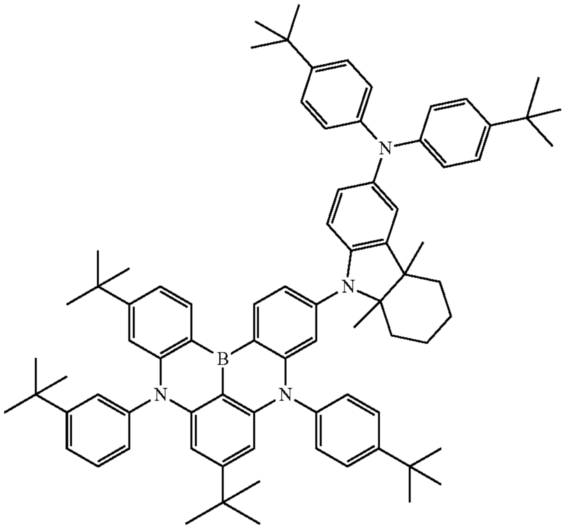

-continued
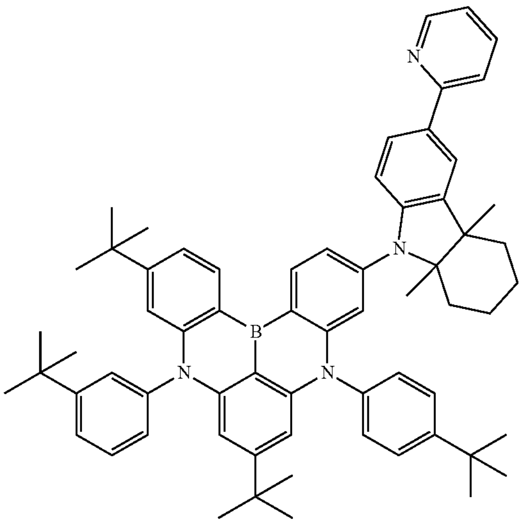
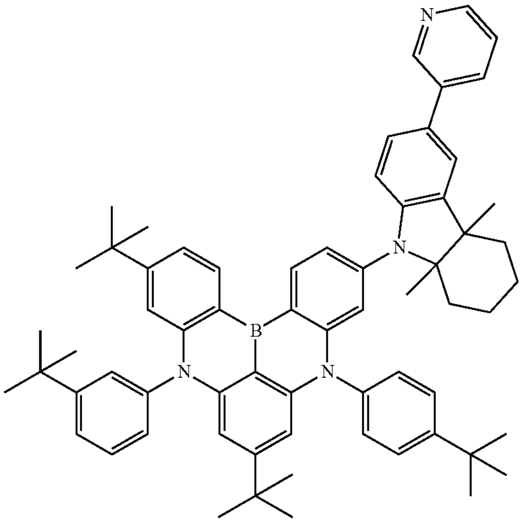
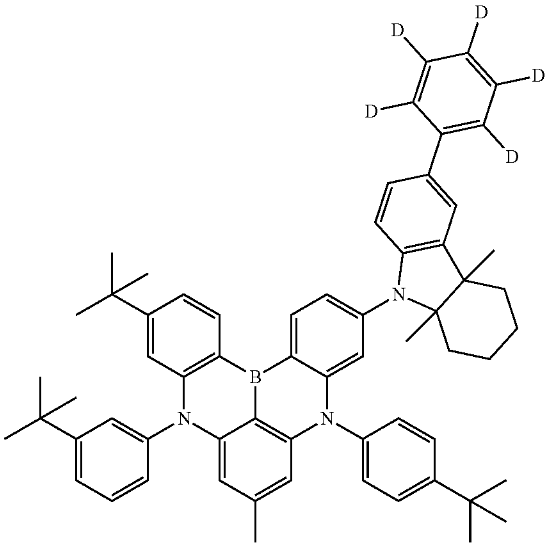
-continued
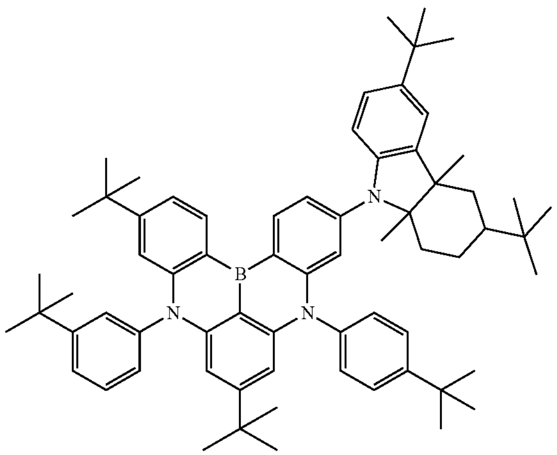
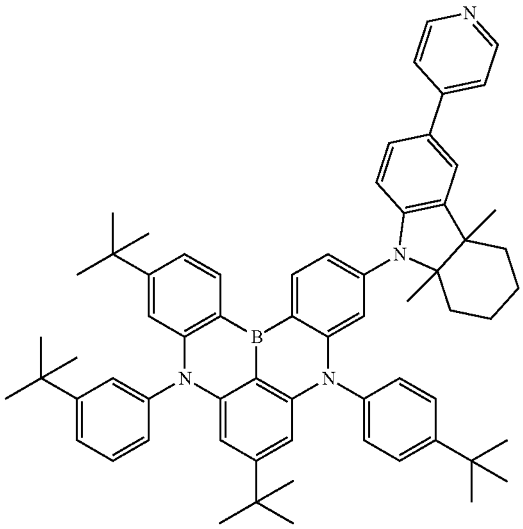
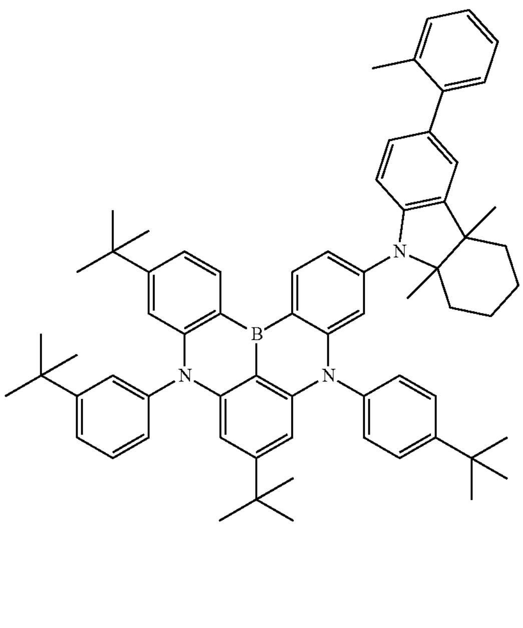

-continued
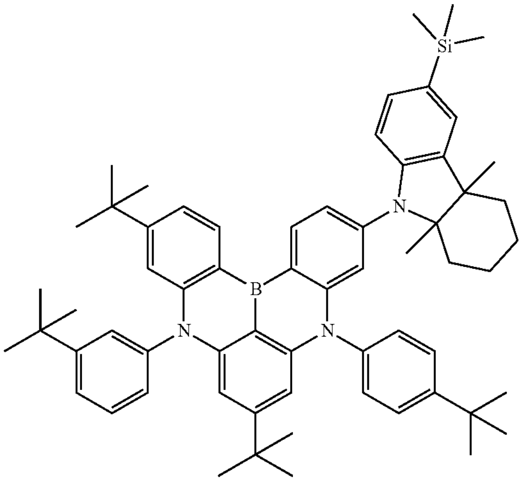
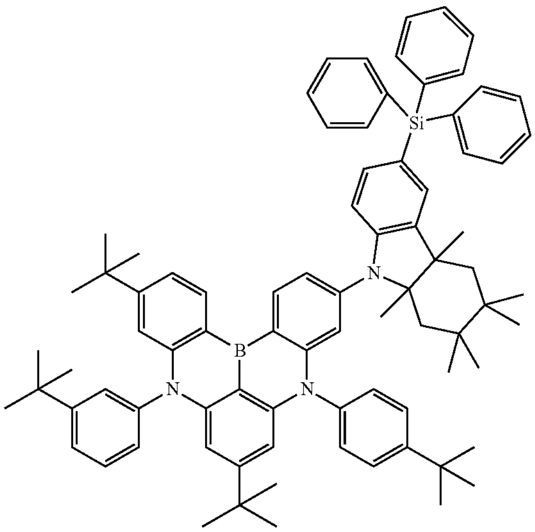
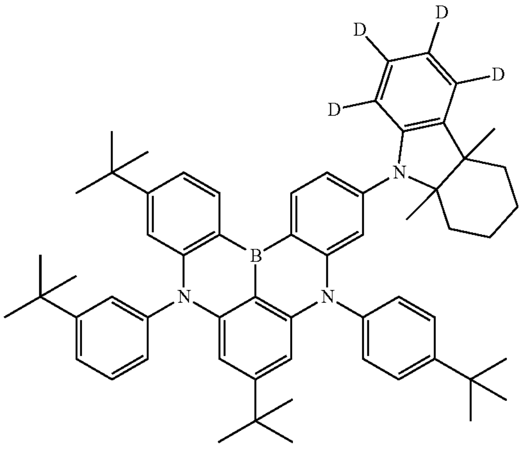
-continued
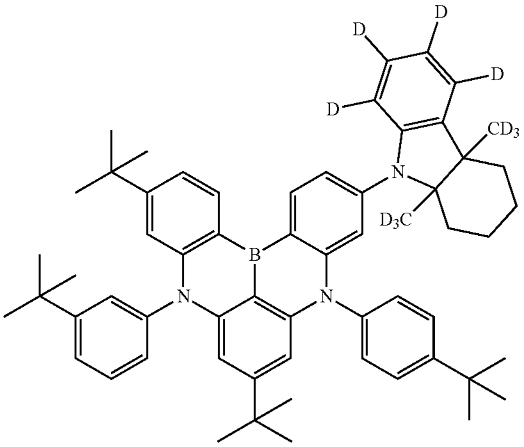
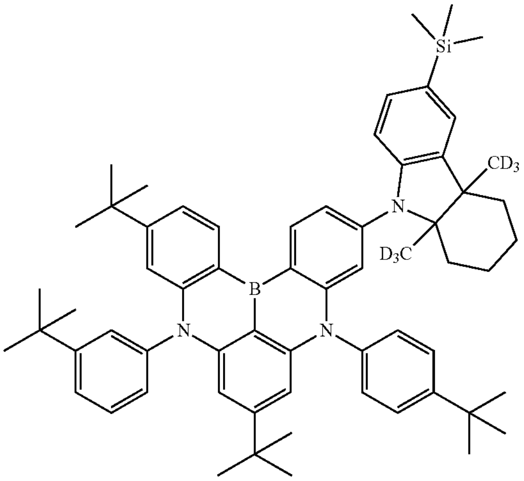
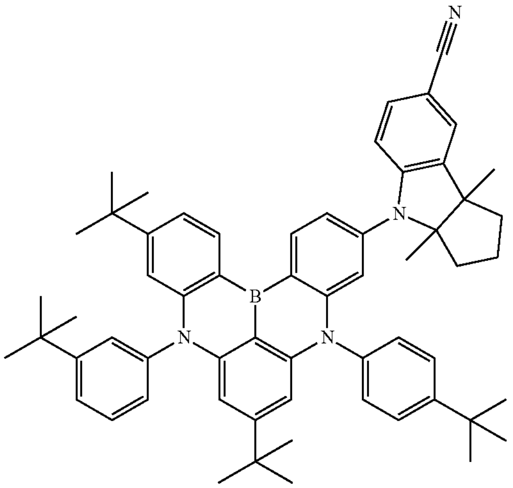

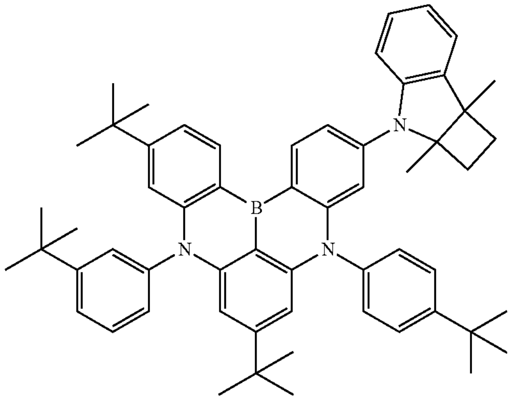
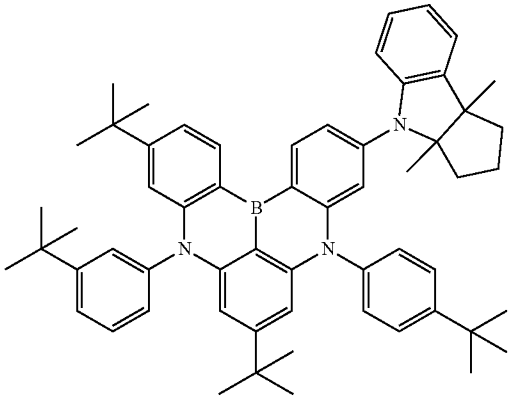
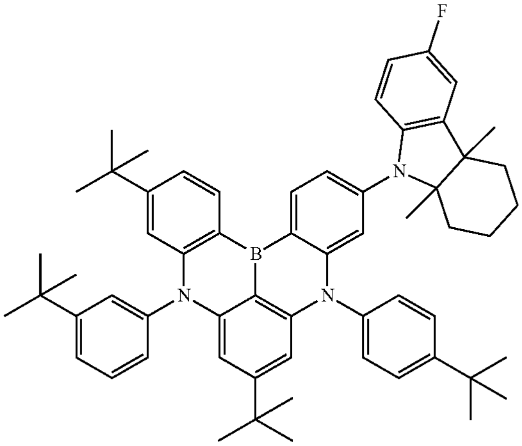
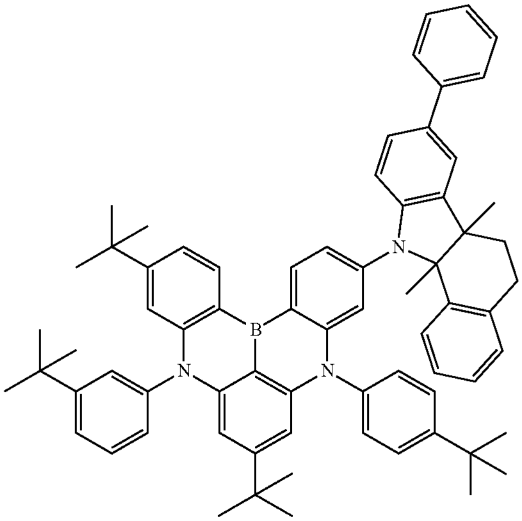
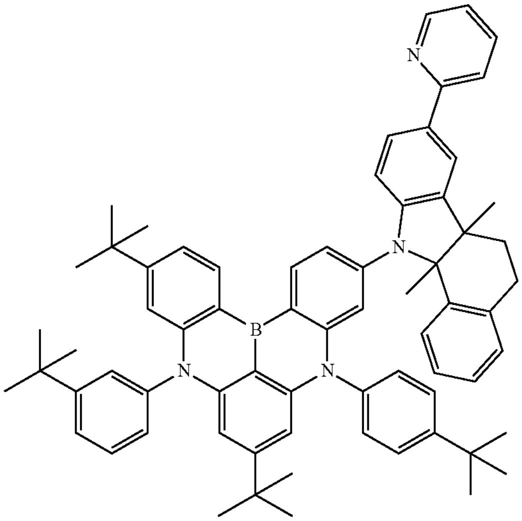
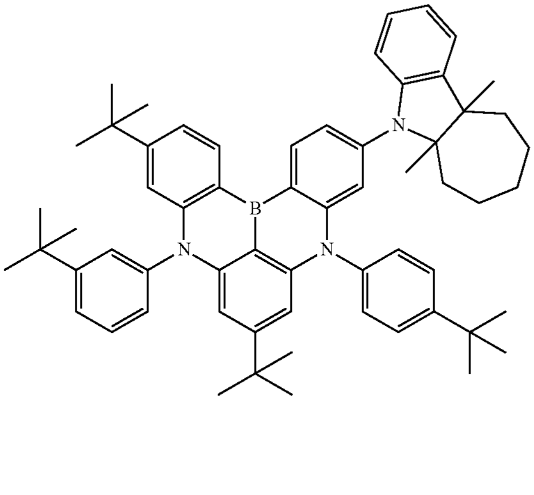

-continued
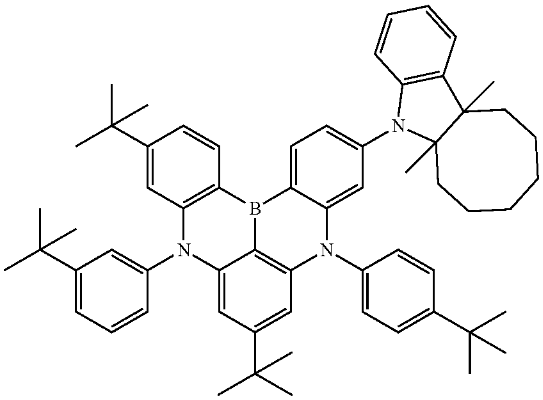
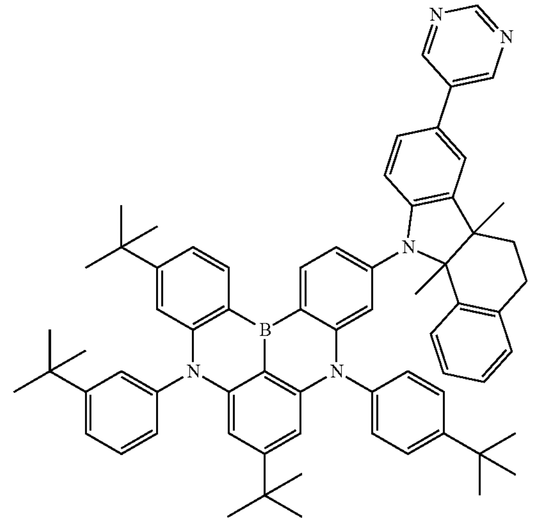
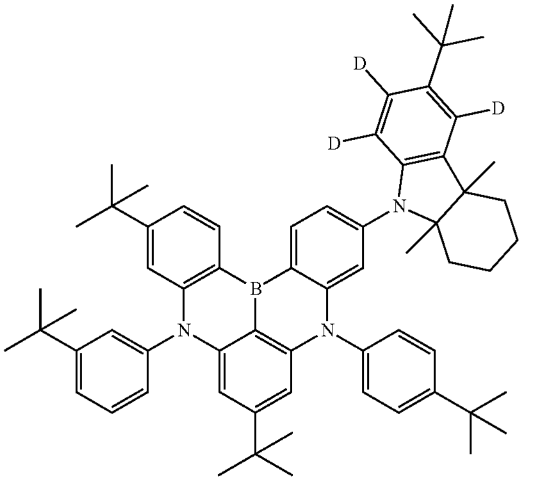
-continued
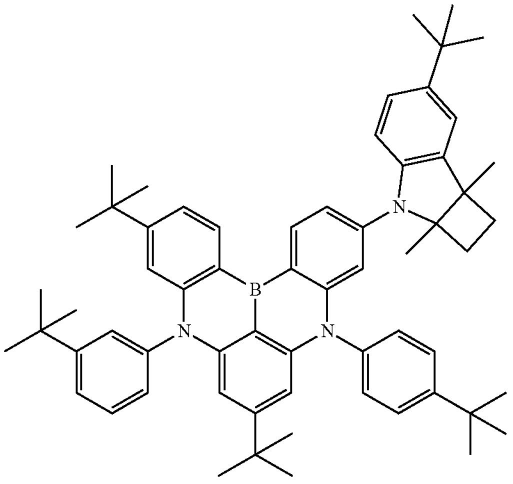
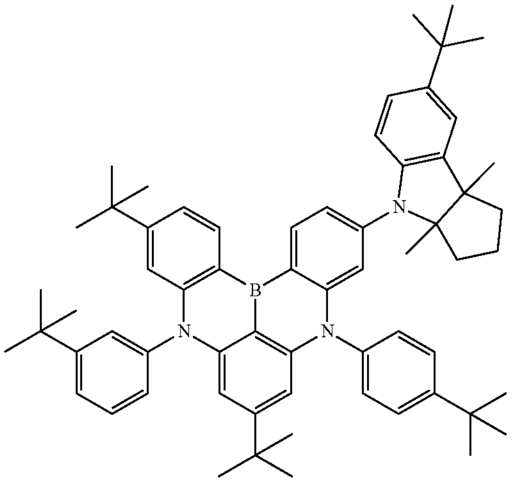
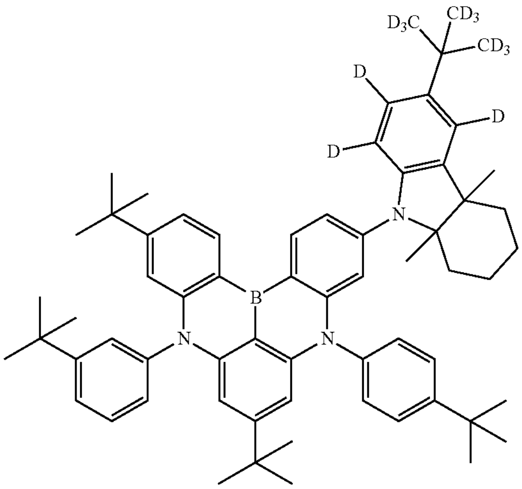

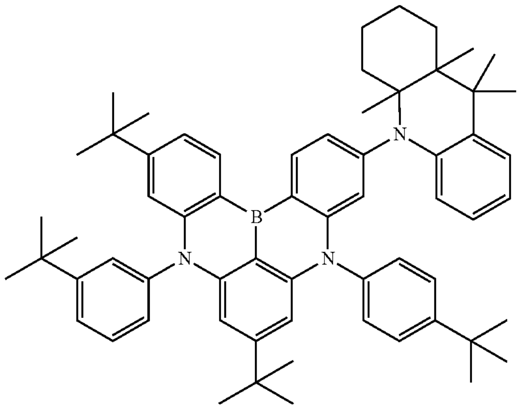
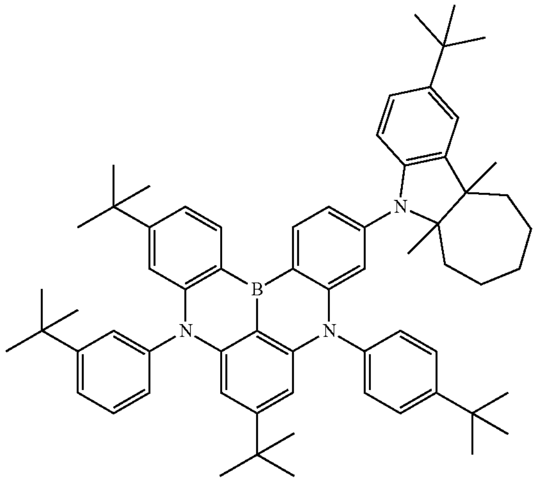
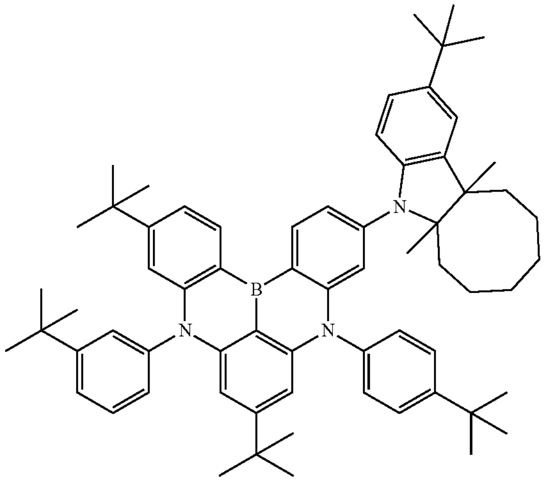
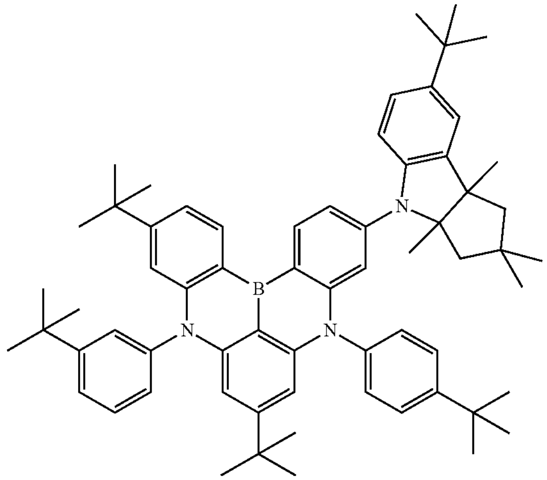
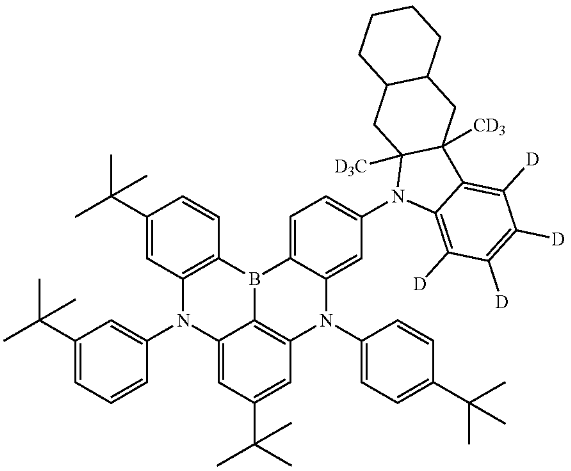
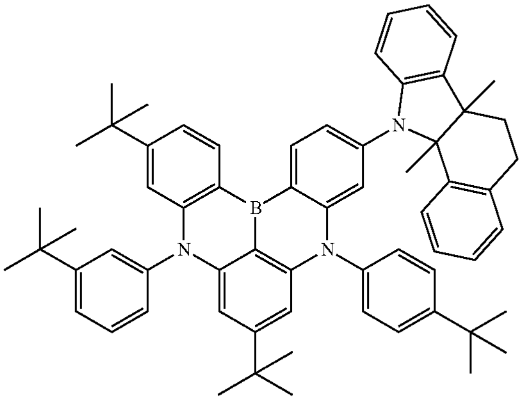

-continued
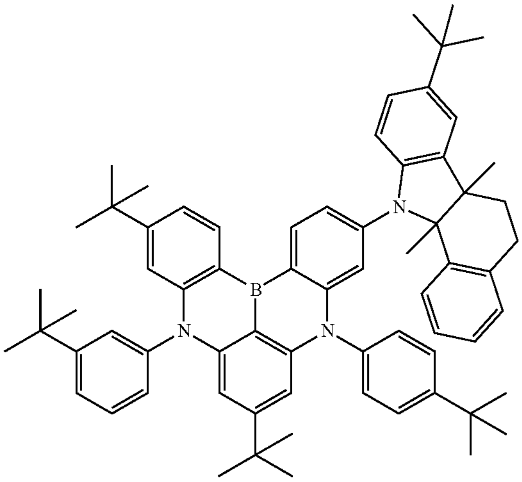
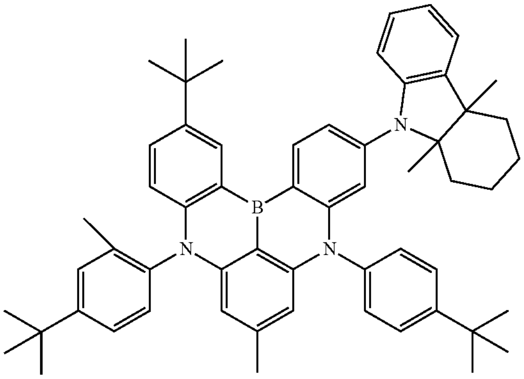
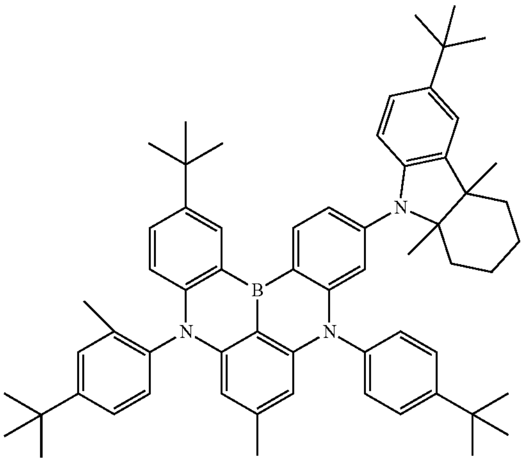
-continued
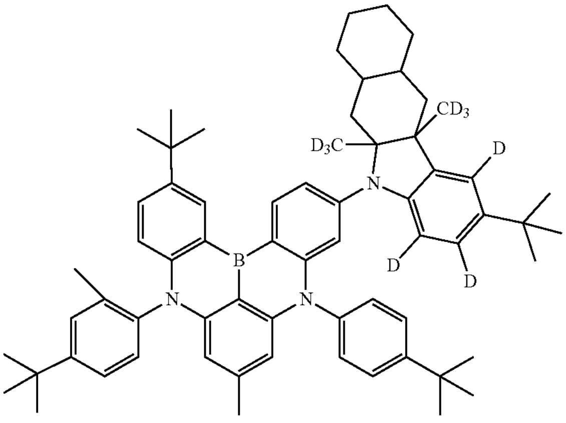
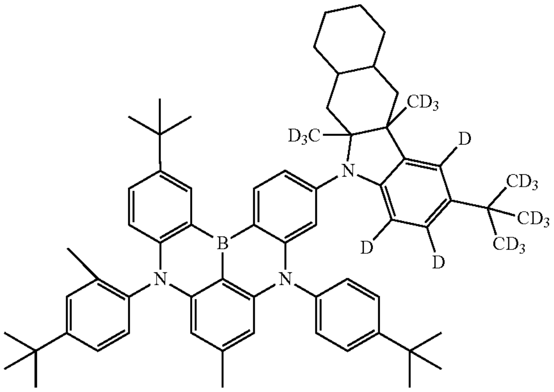
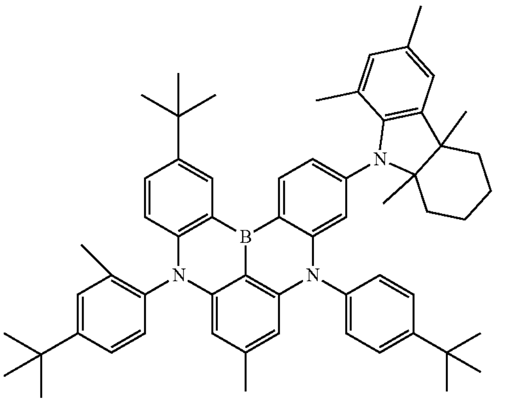
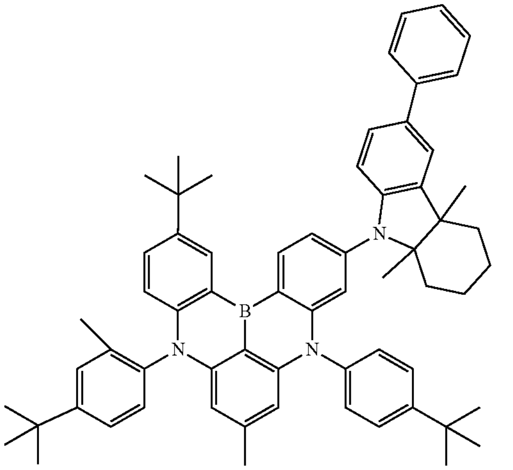

-continued
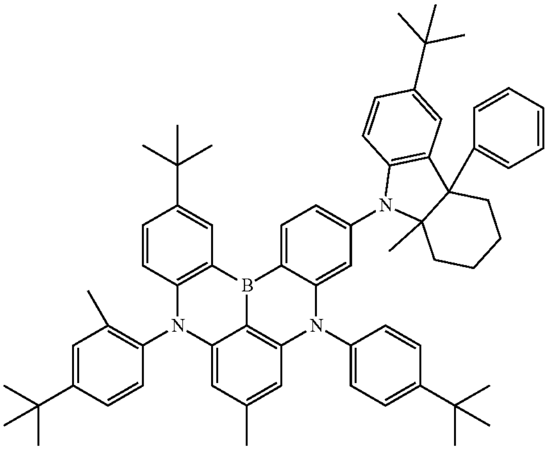
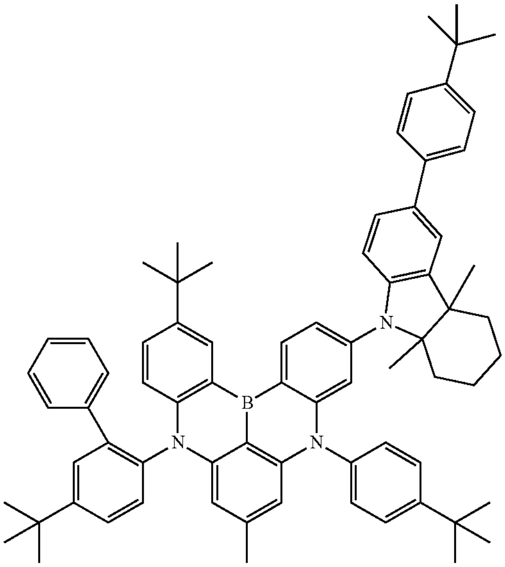
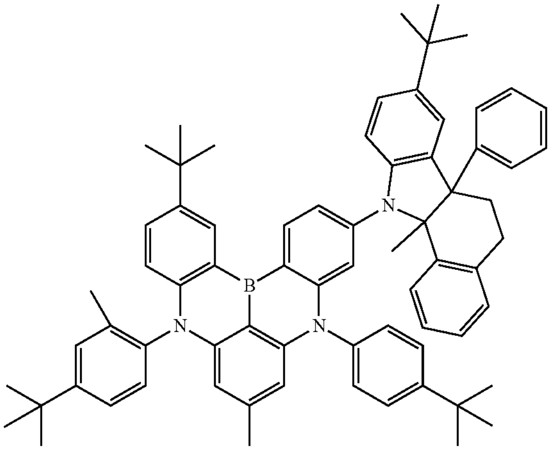
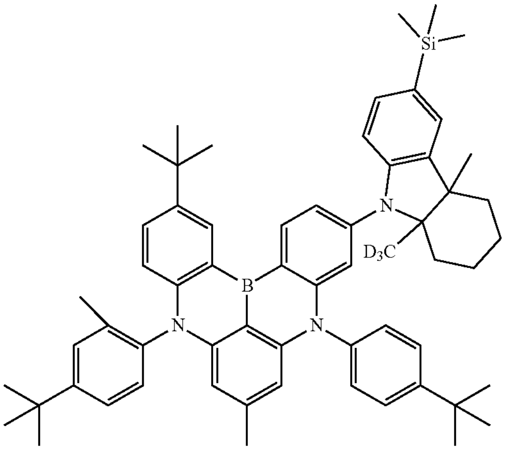
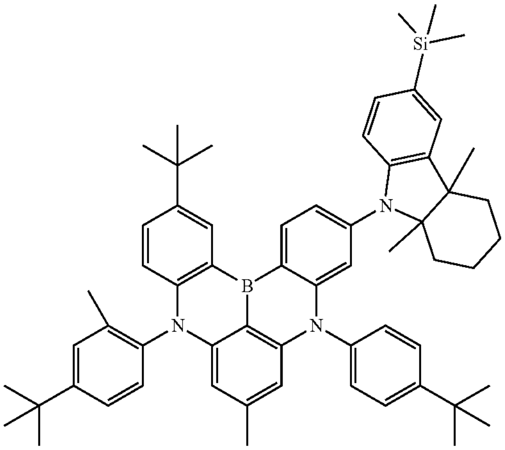
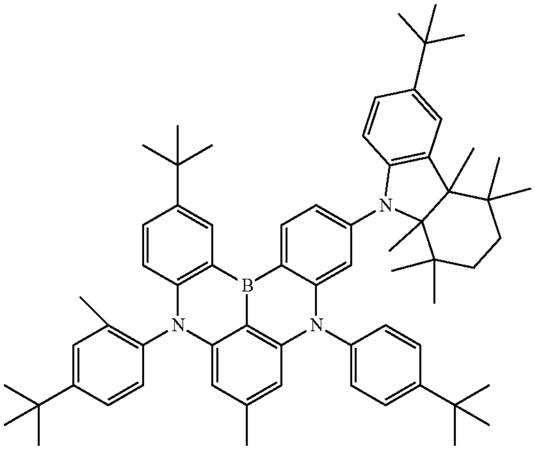
-continued -continued
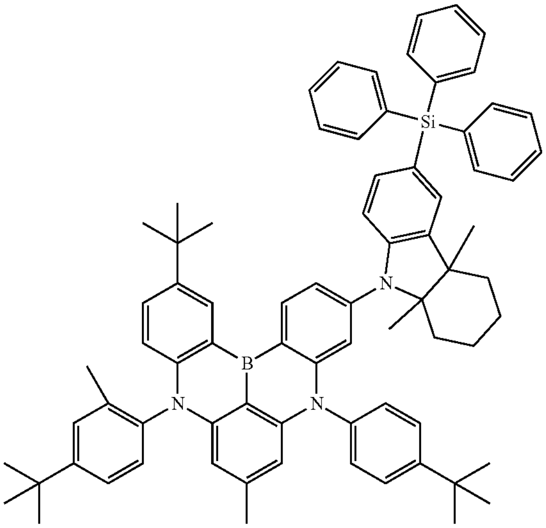
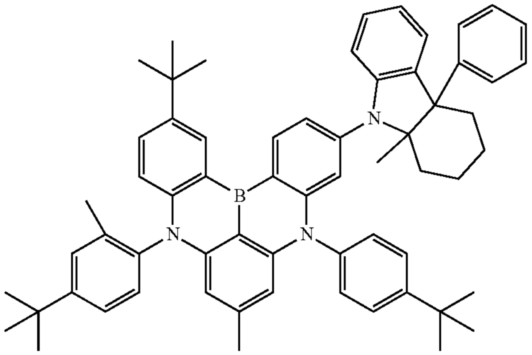
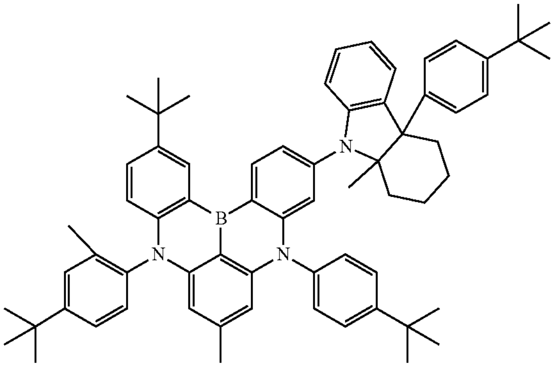
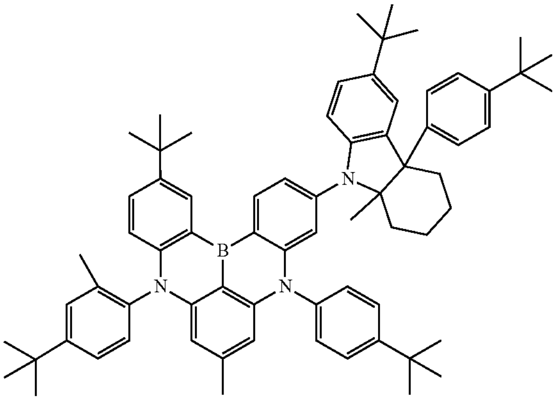
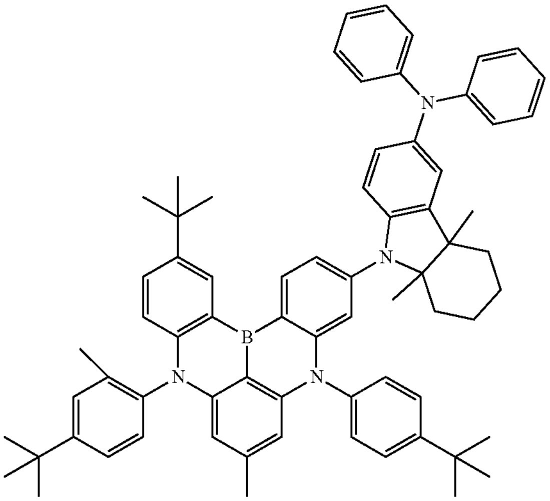
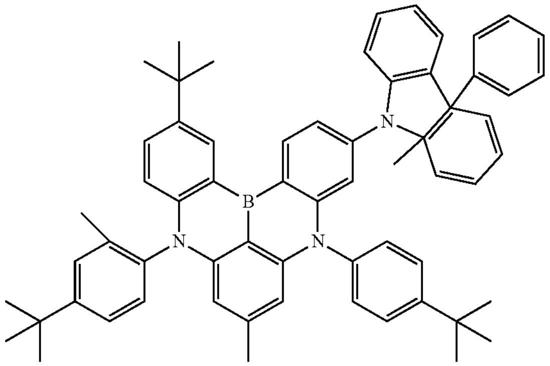
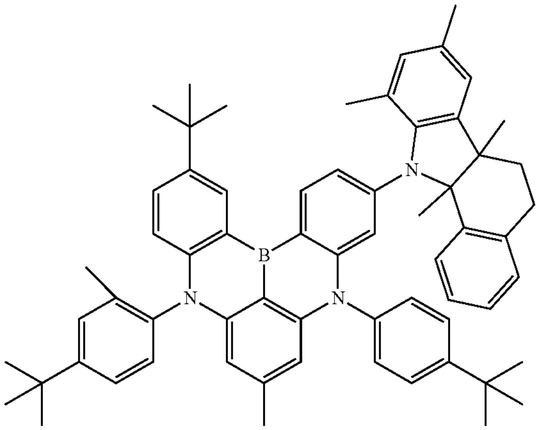

-continued
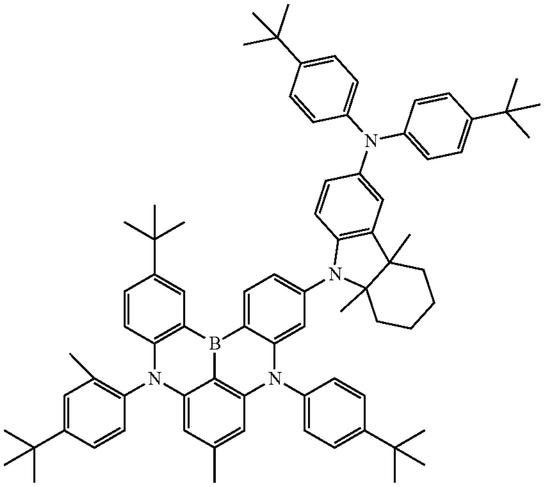
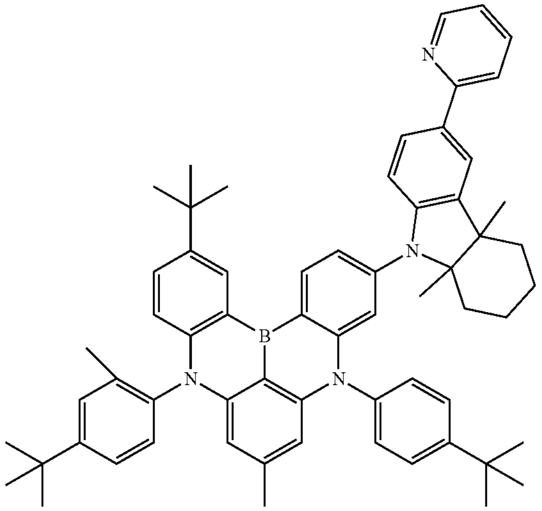
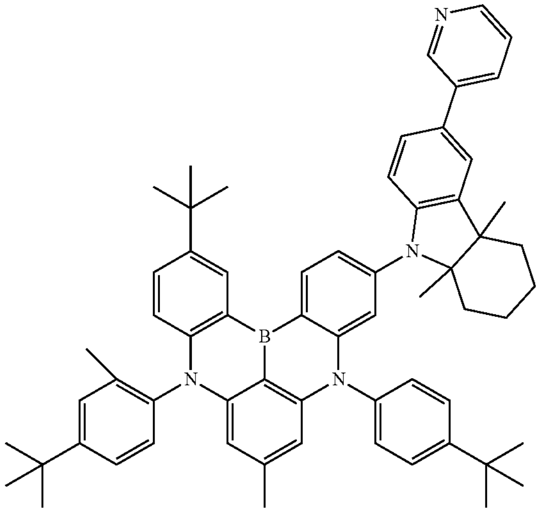
-continued
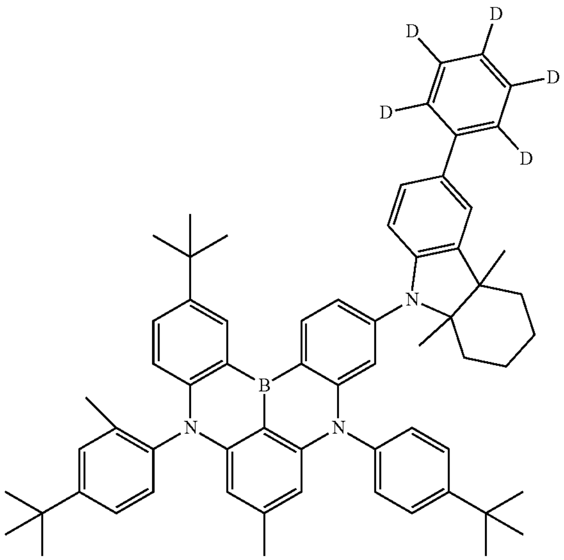
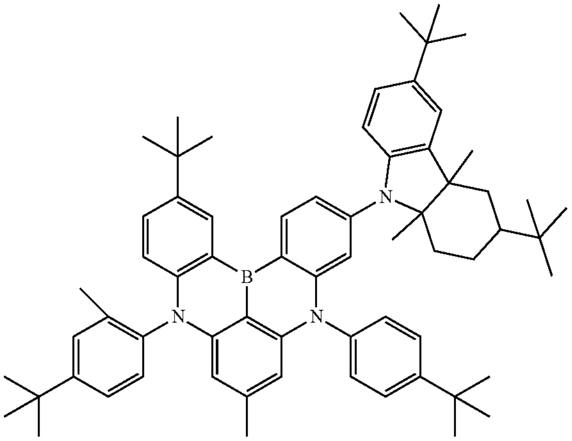
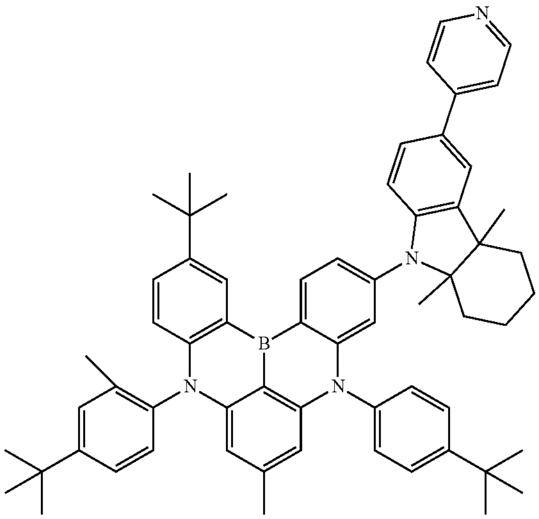

-continued
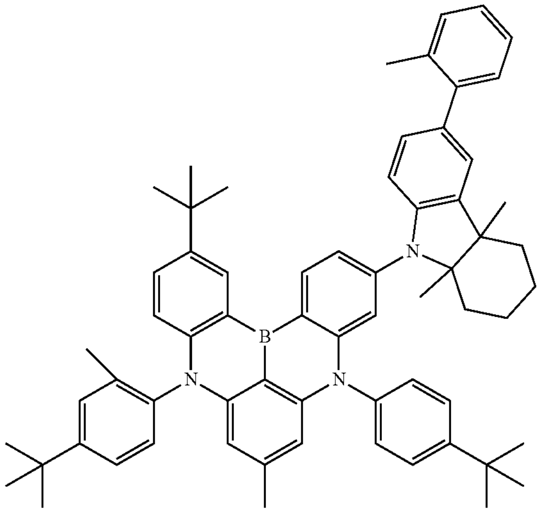
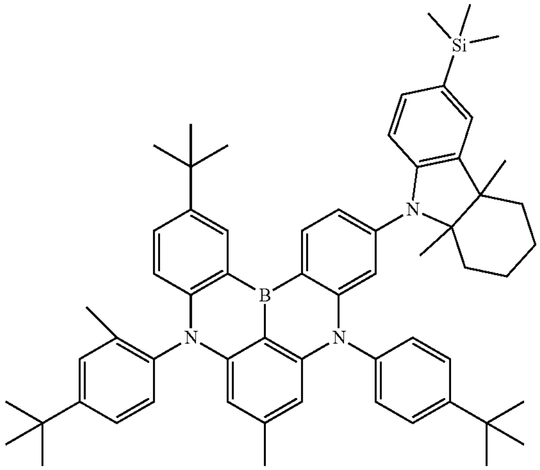
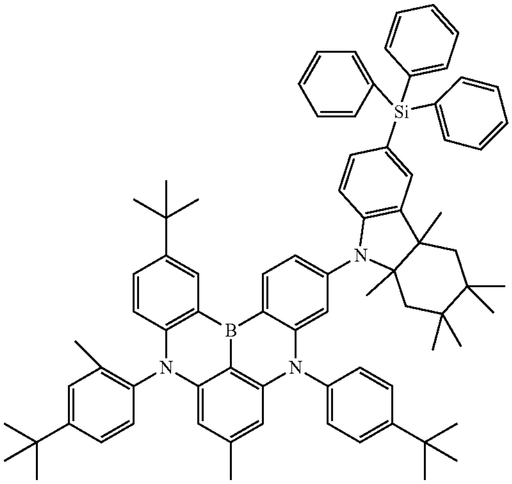
-continued
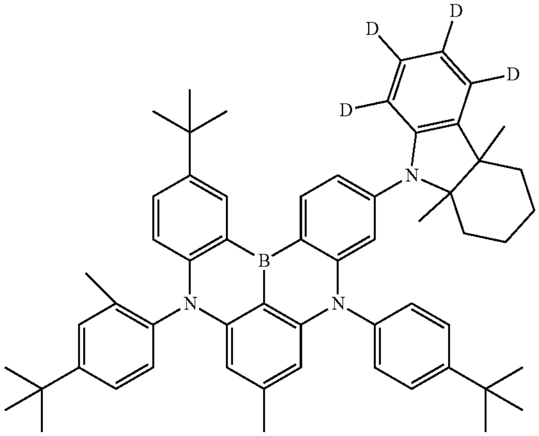
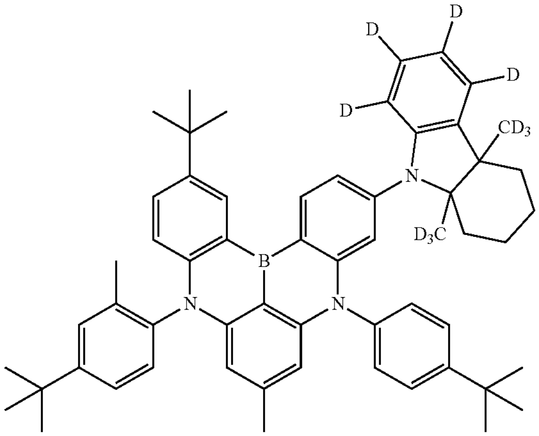
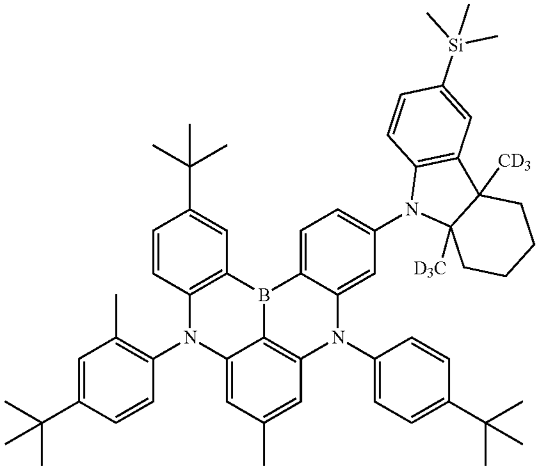

-continued
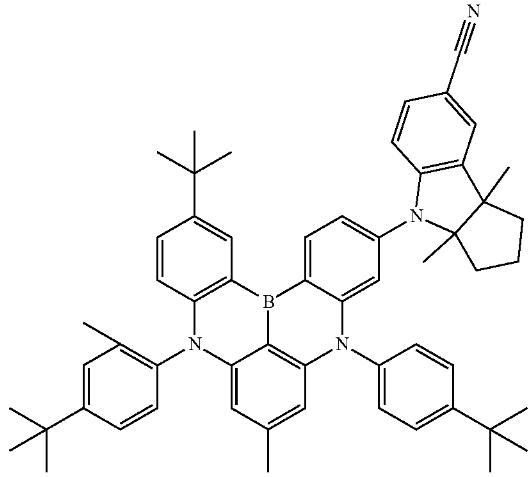
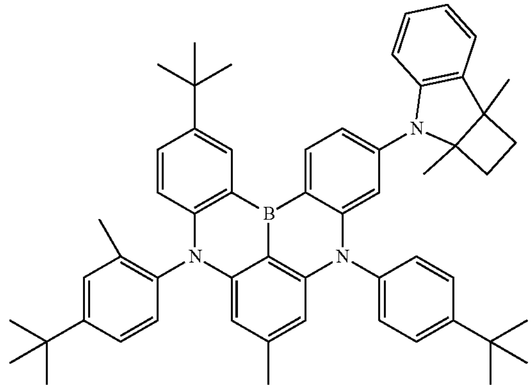
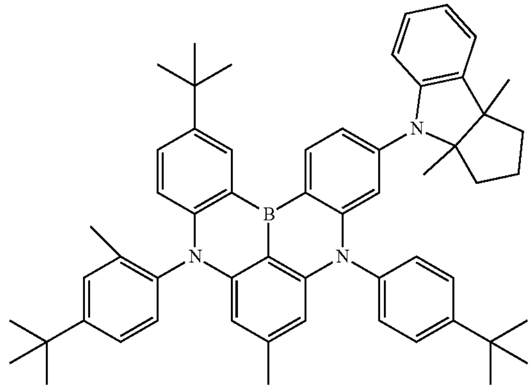
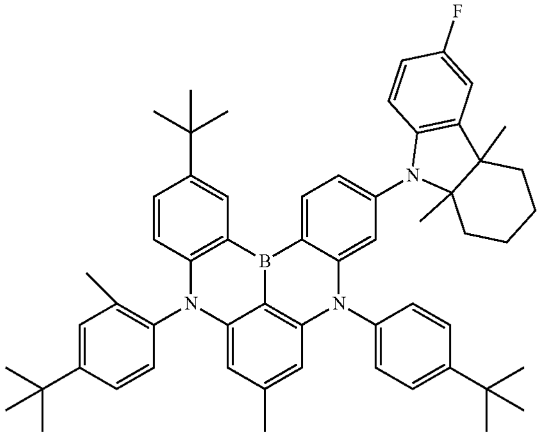
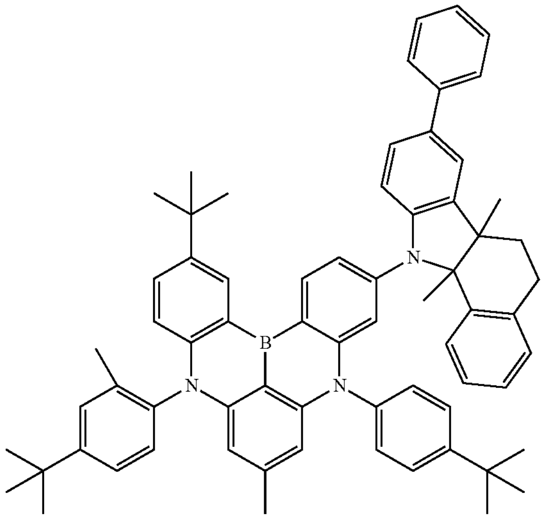
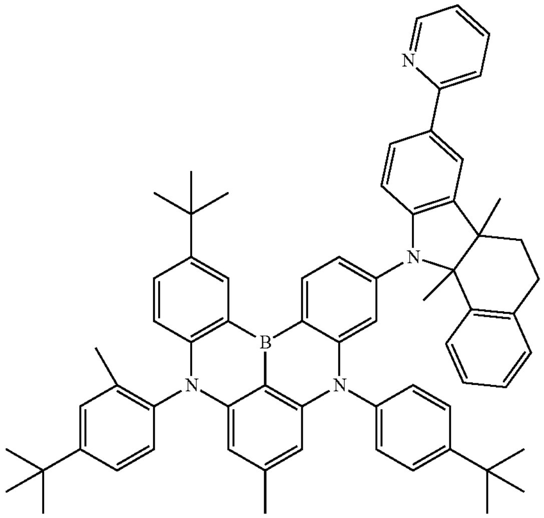
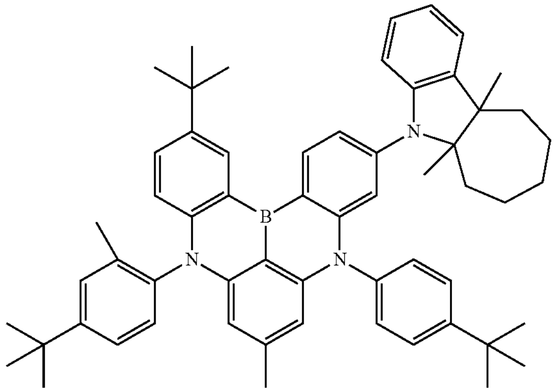

-continued
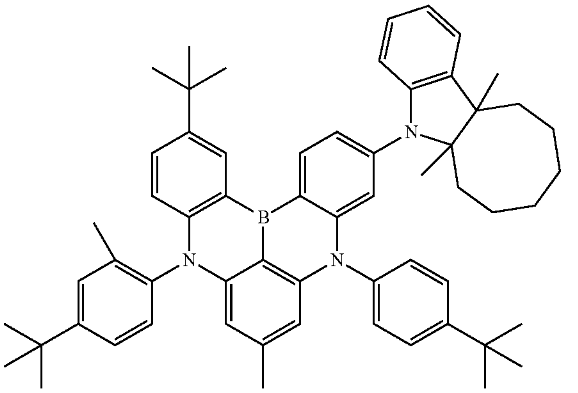
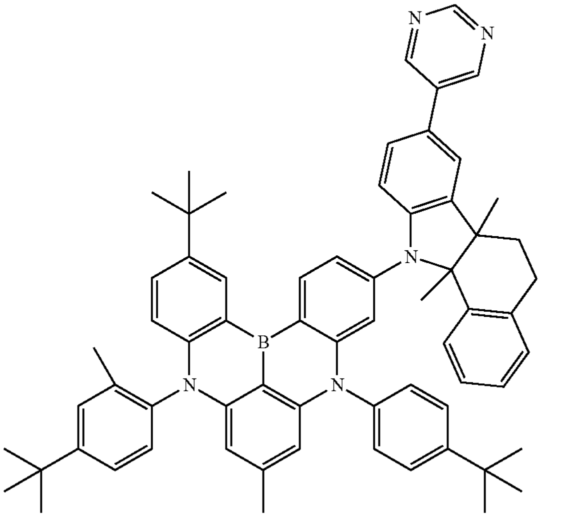
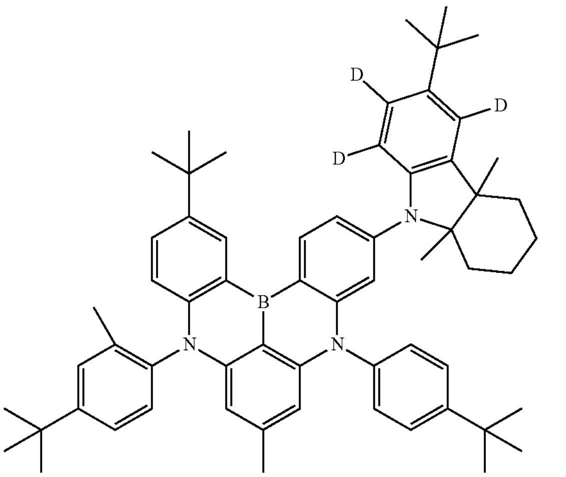
-continued
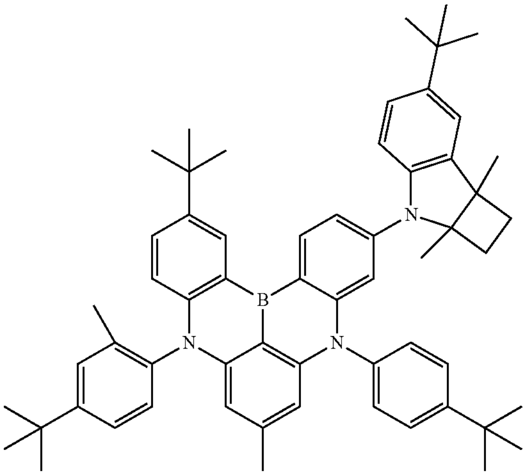
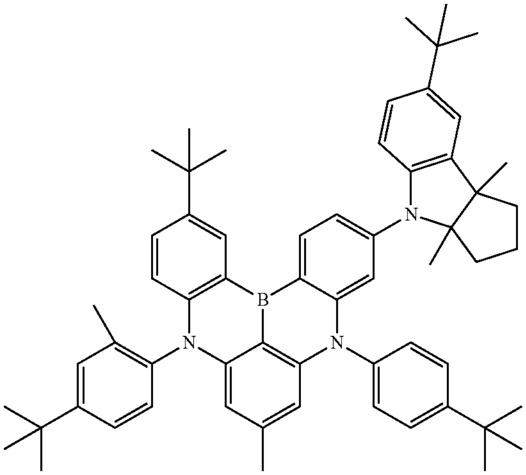
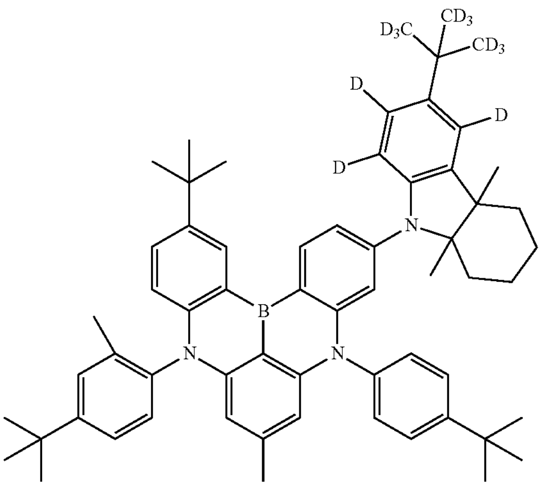

-continued
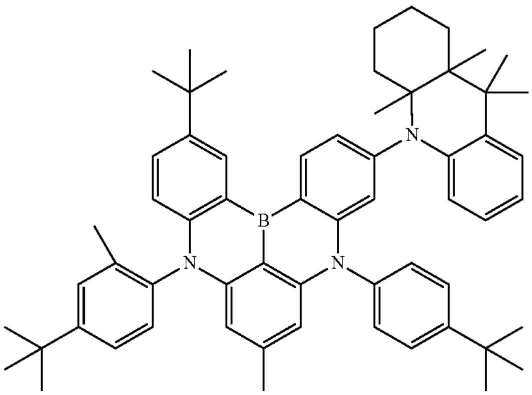
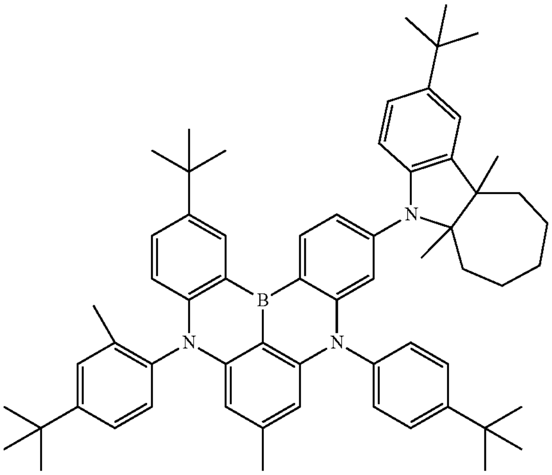
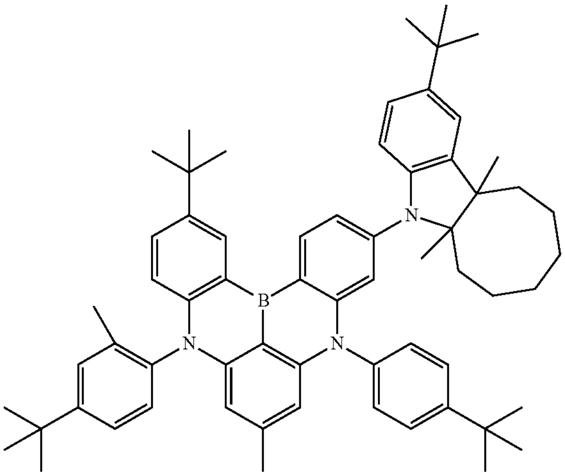
-continued
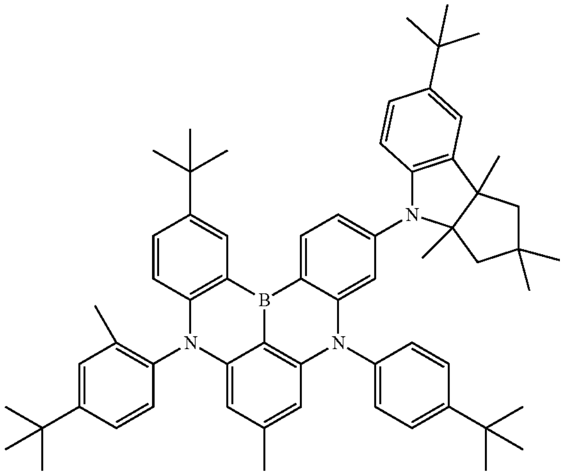
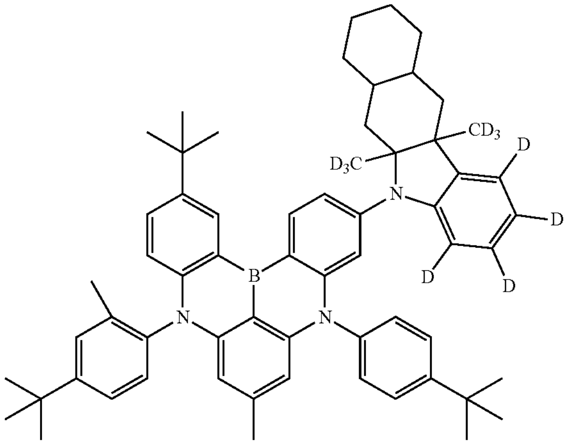
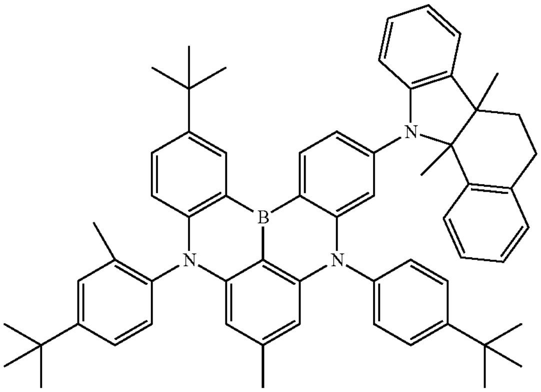

-continued
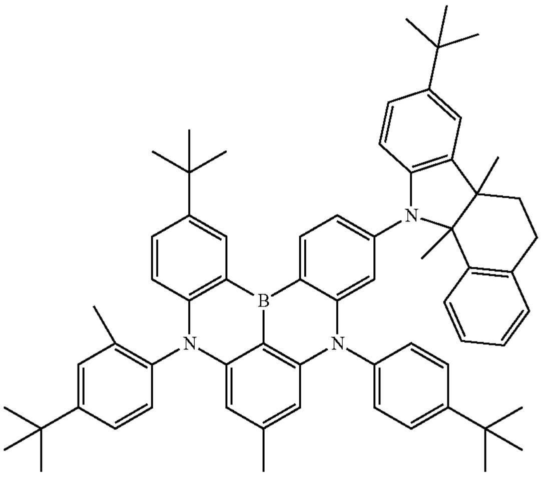
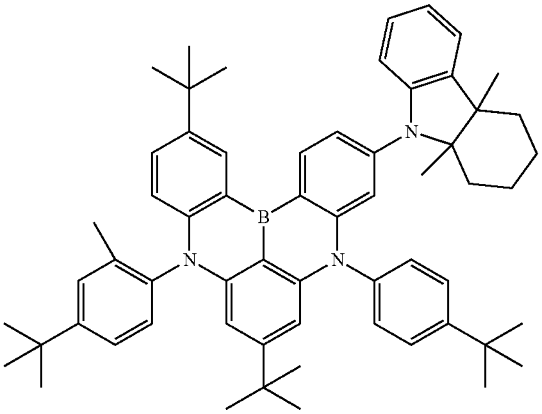
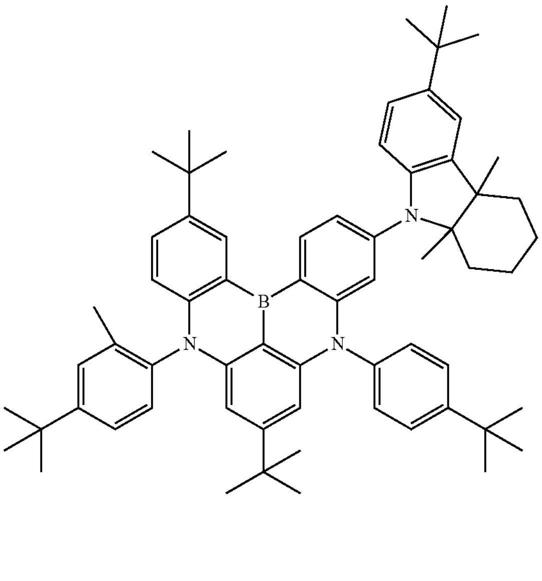
-continued
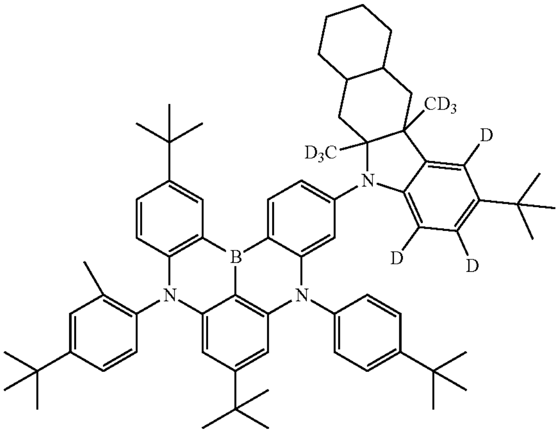
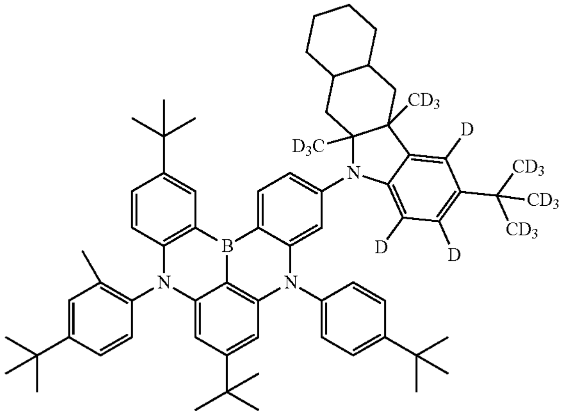
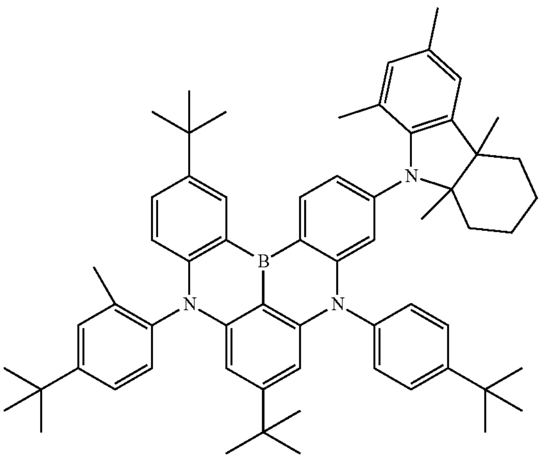

-continued
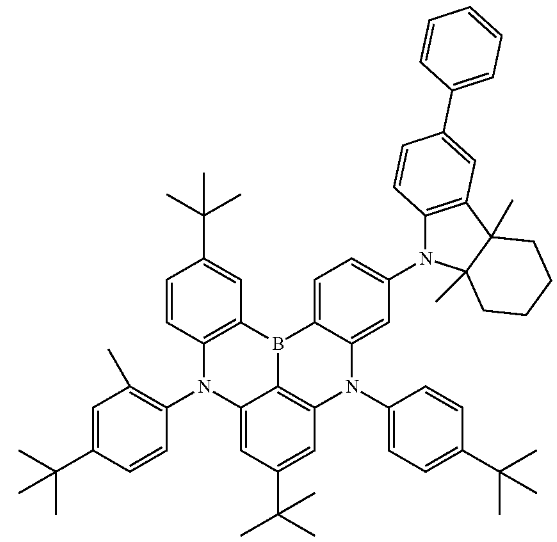
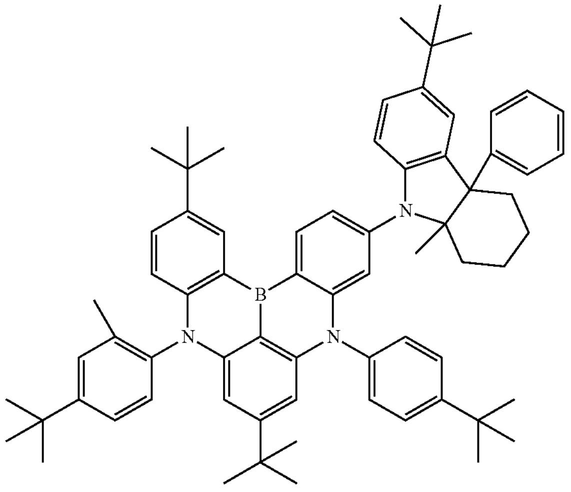
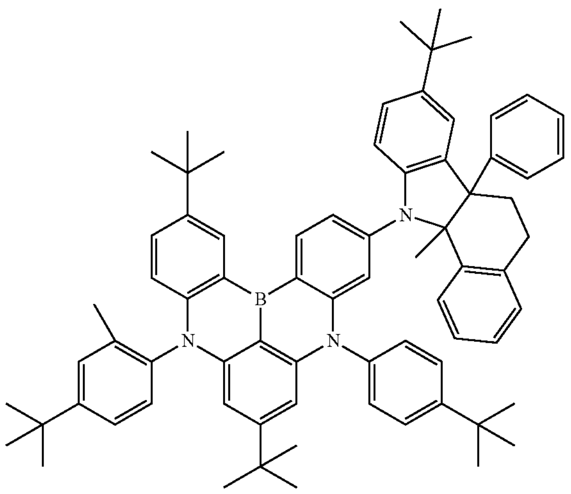
-continued
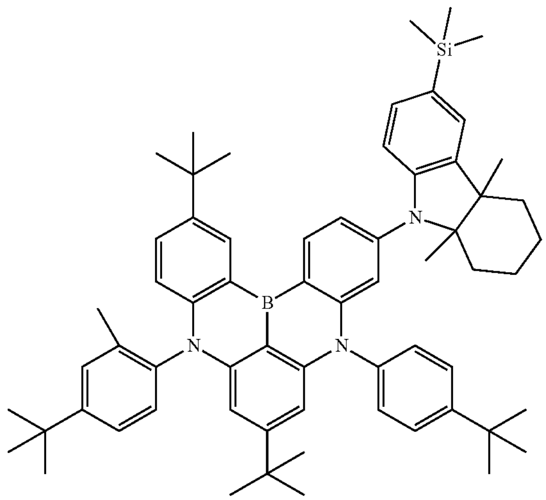
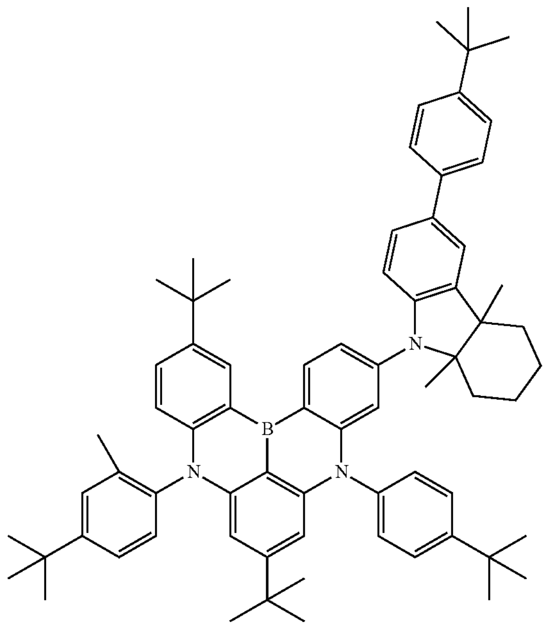
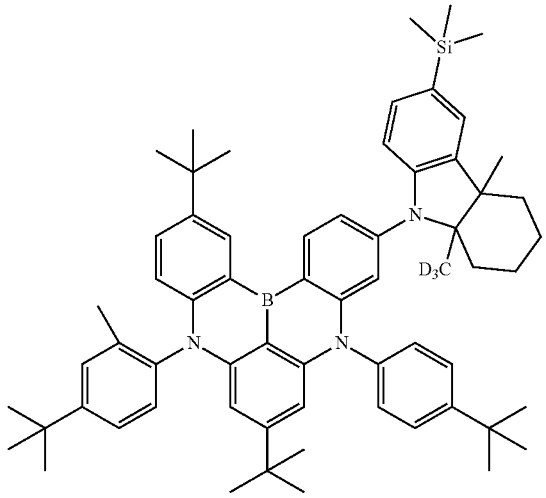

-continued
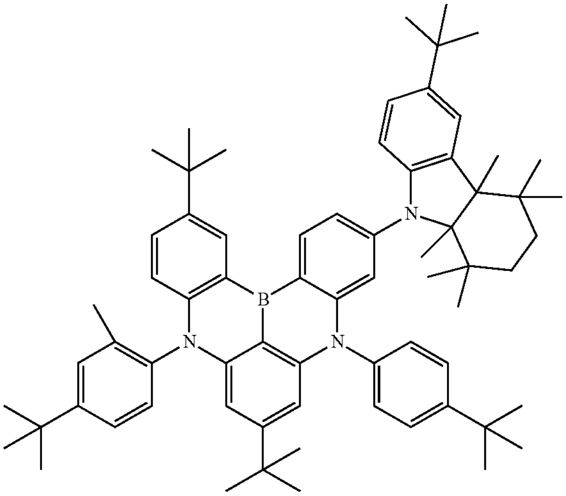
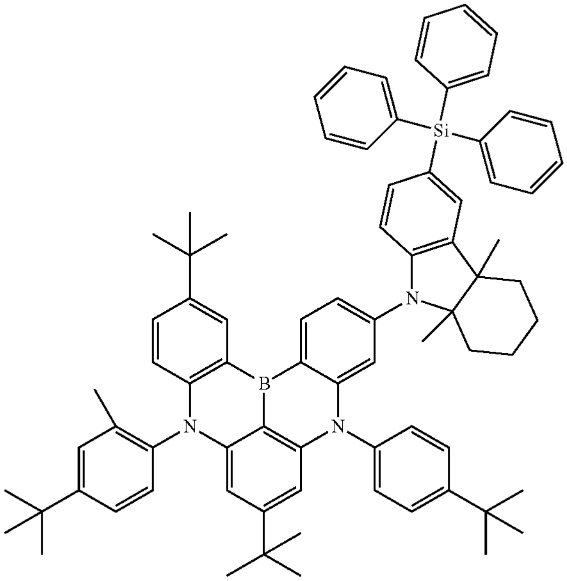
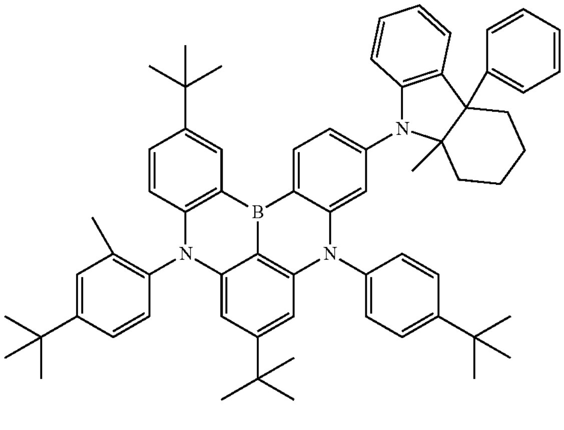
-continued
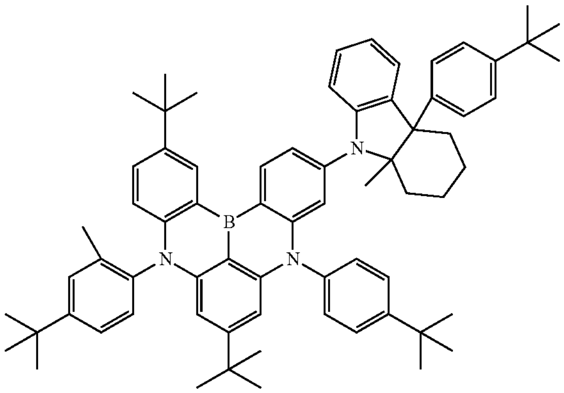
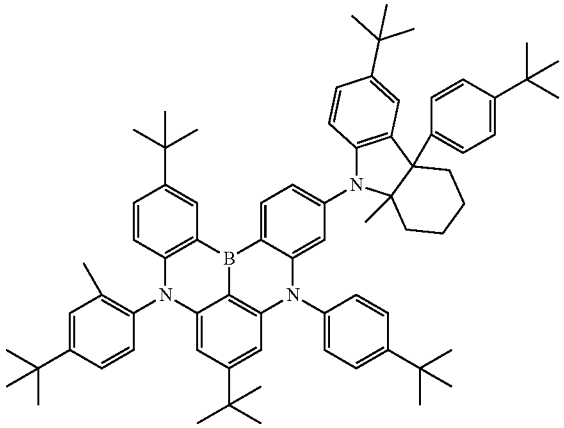
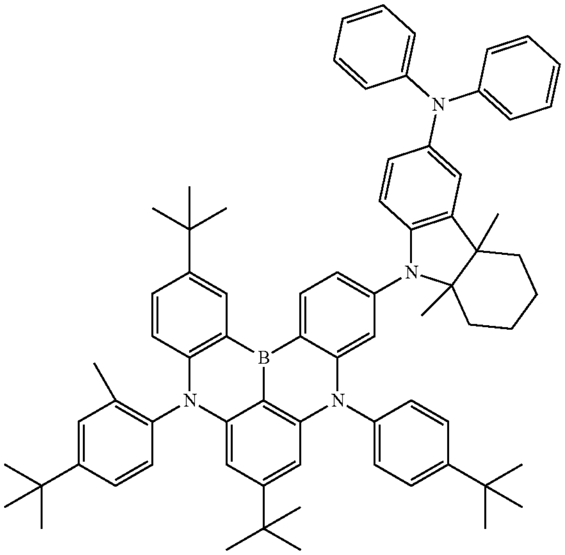

-continued
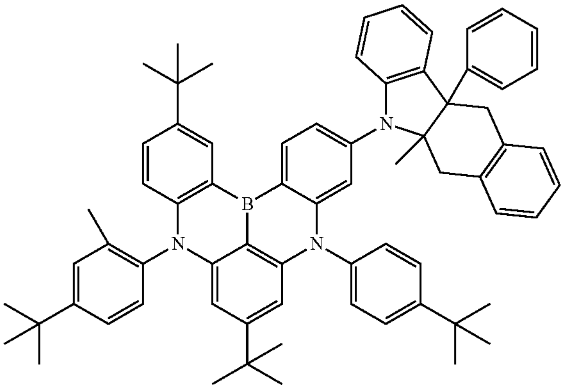
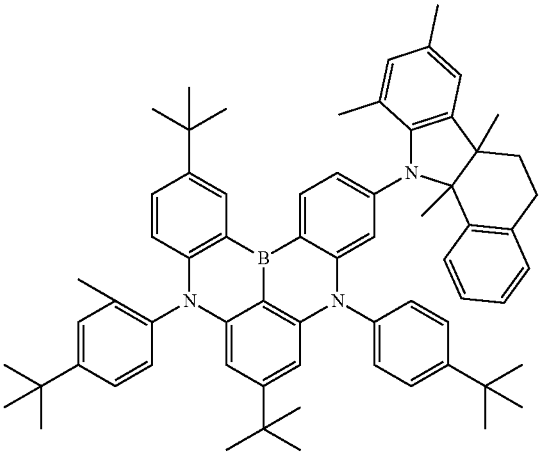
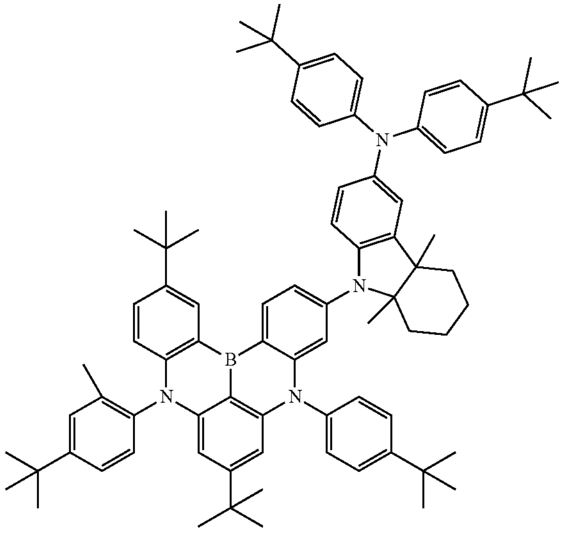
-continued
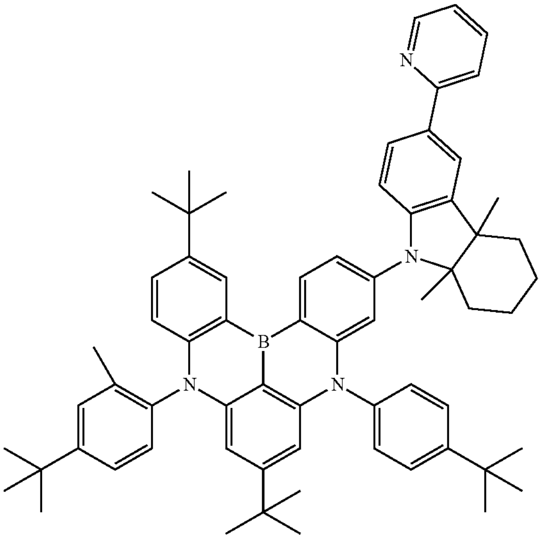
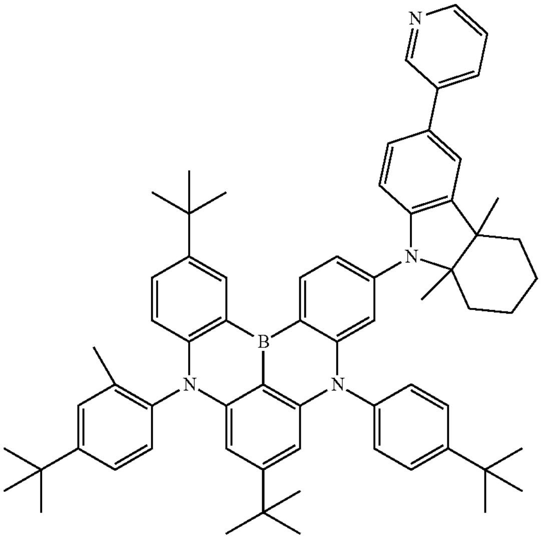
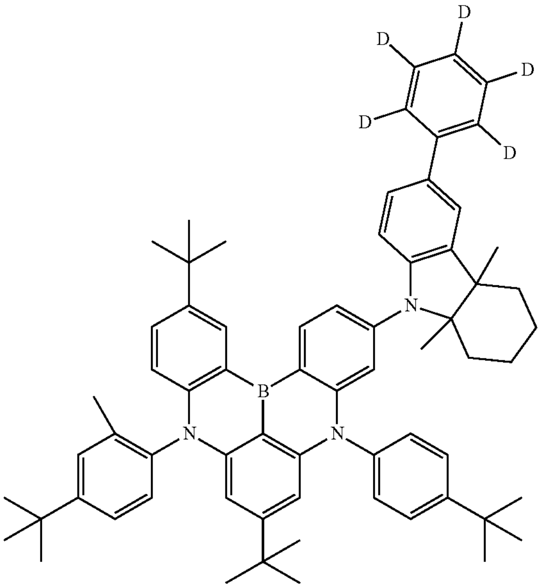

-continued
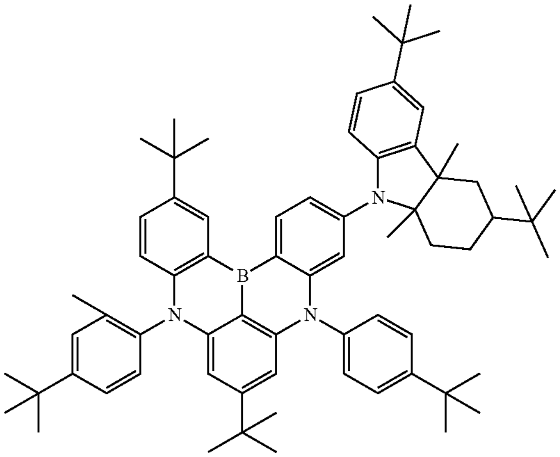
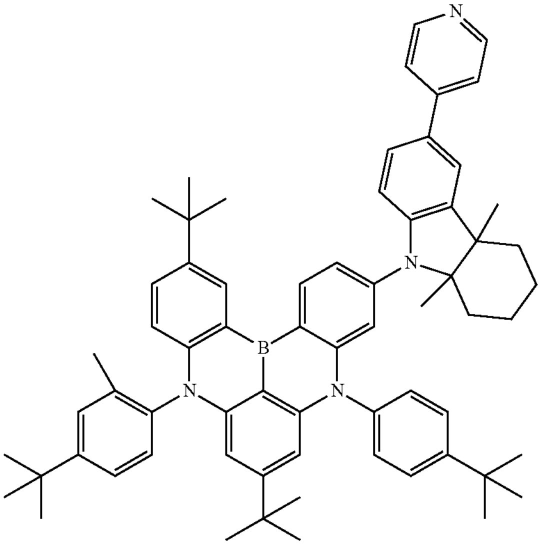
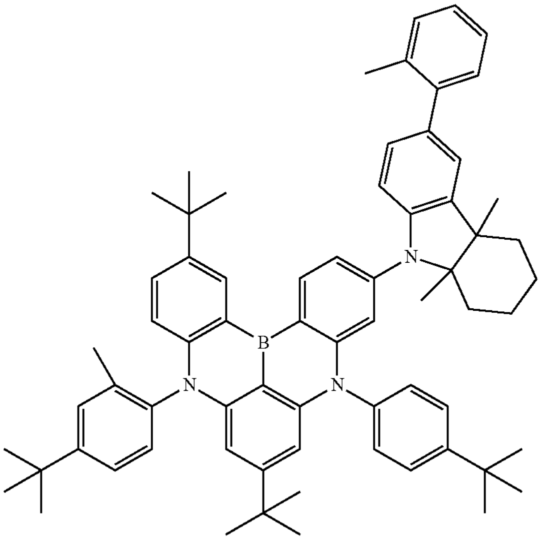
-continued
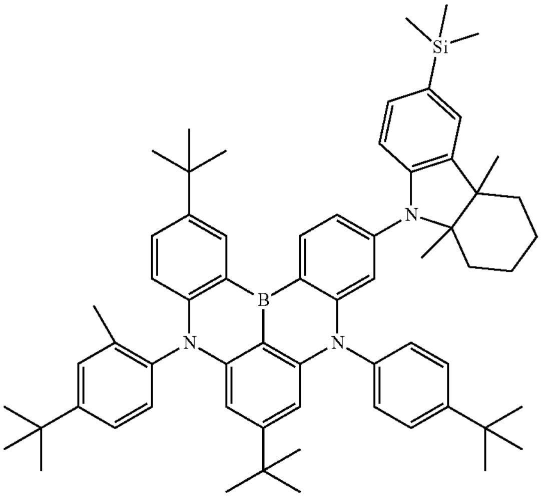
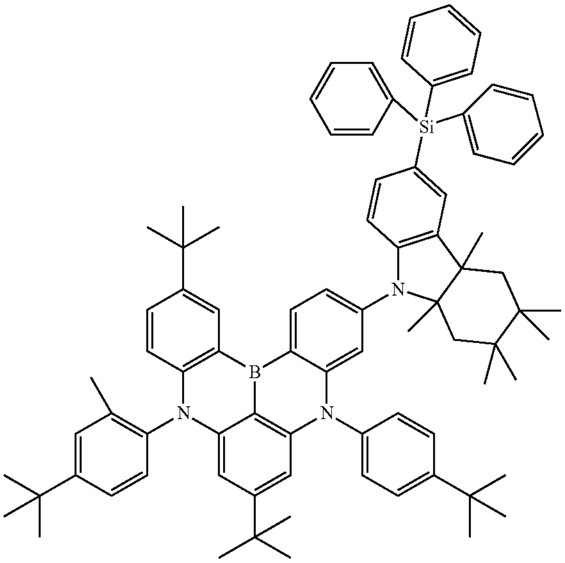
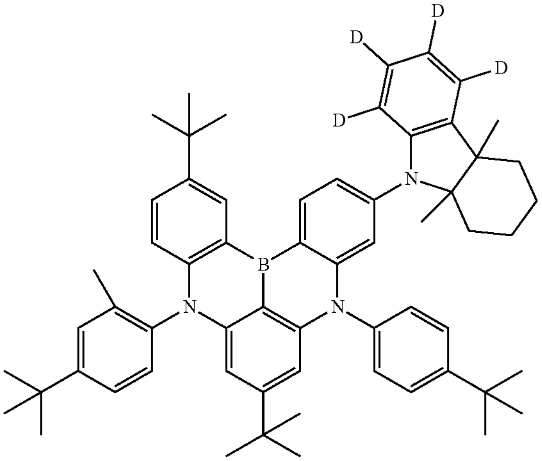

-continued
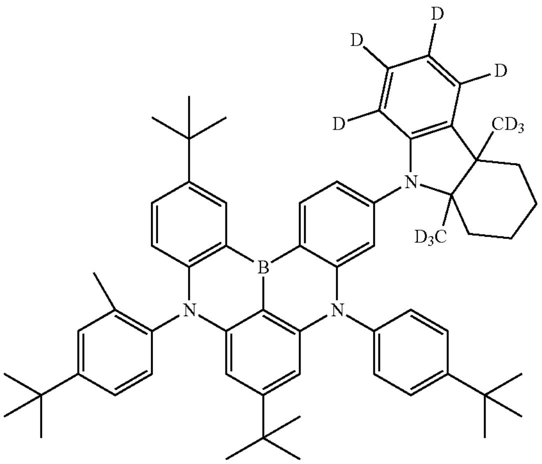
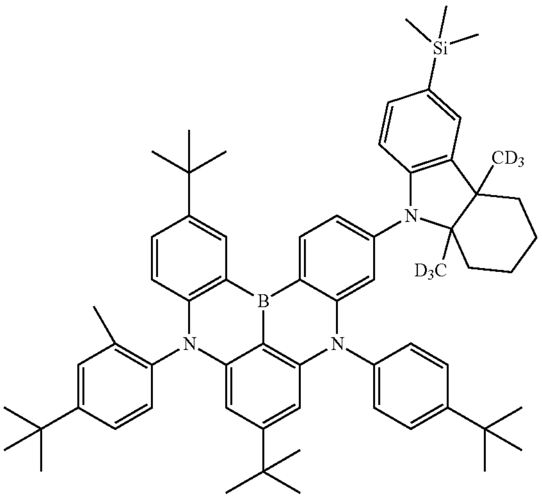
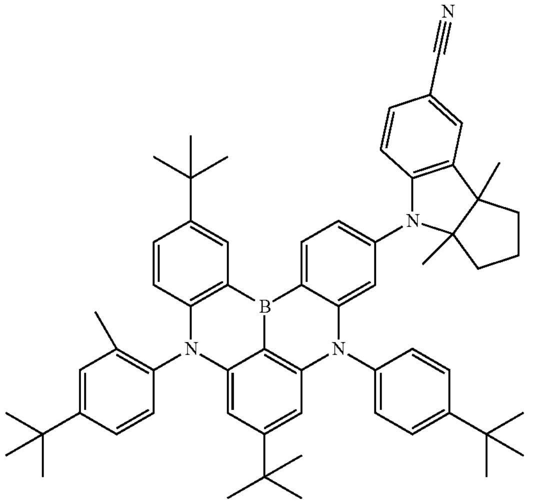
-continued
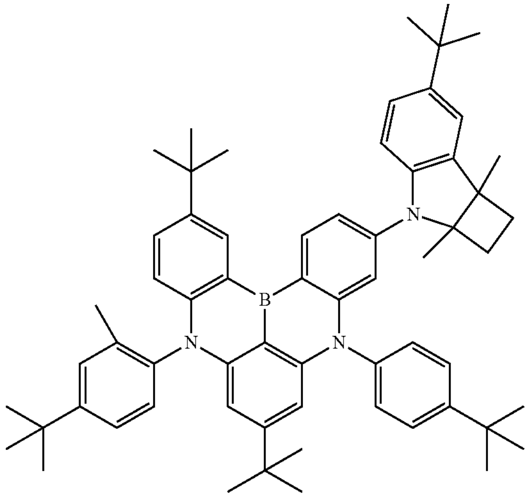
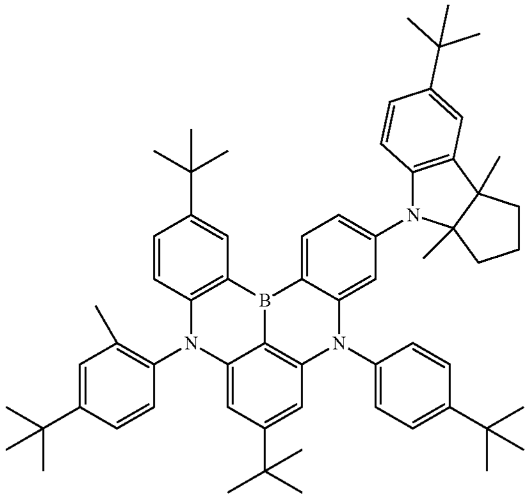
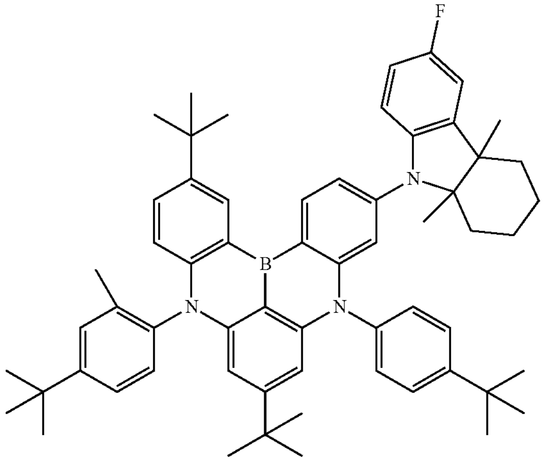

-continued
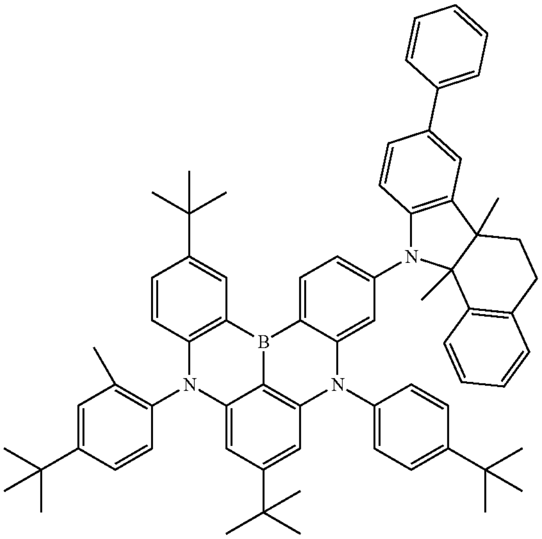
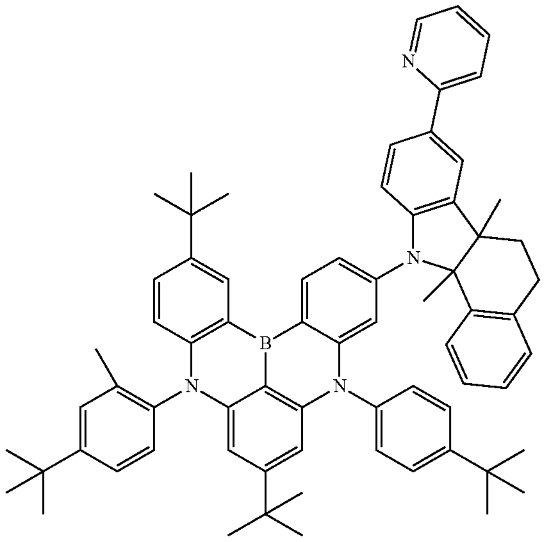
-continued
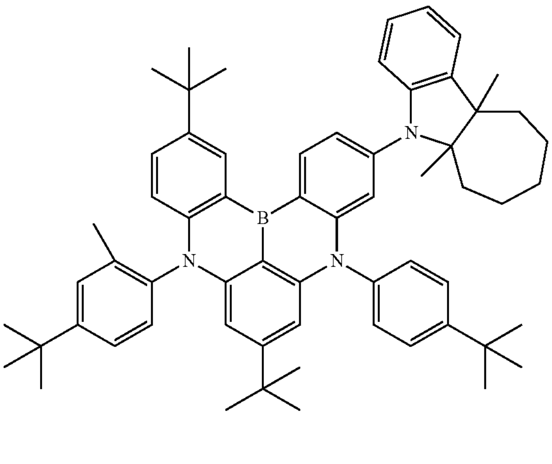
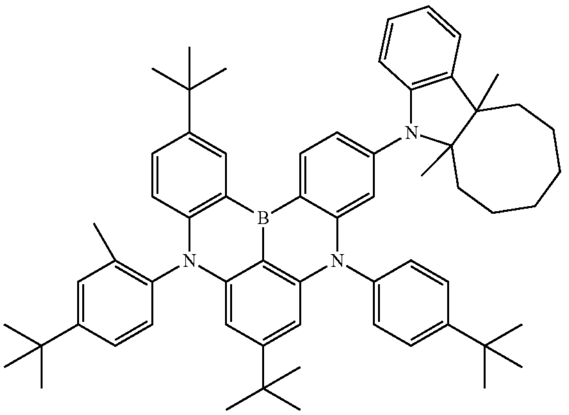
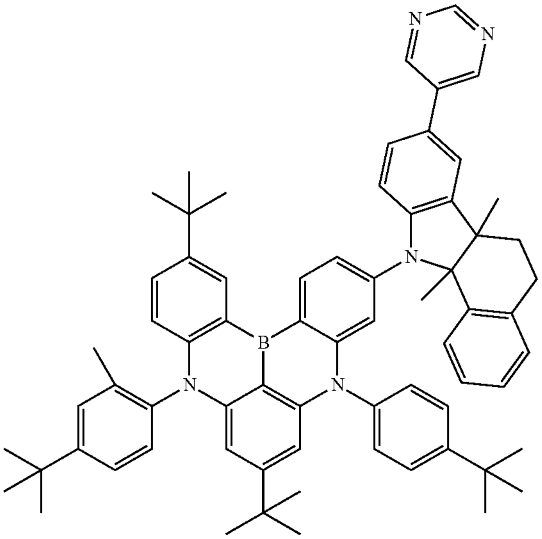
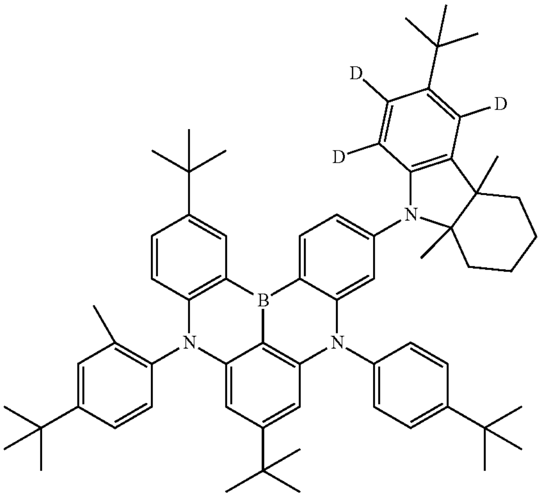

-continued
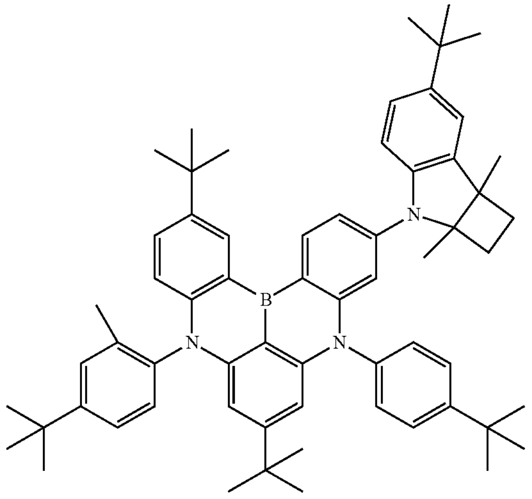
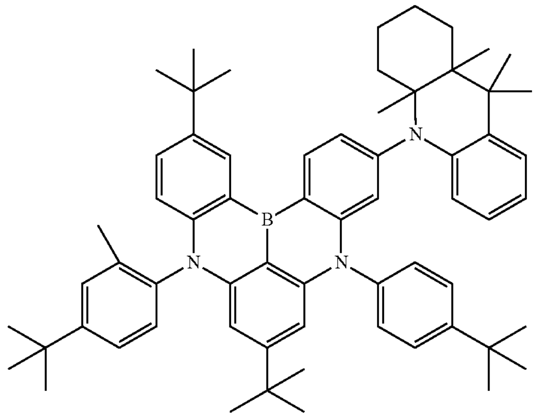
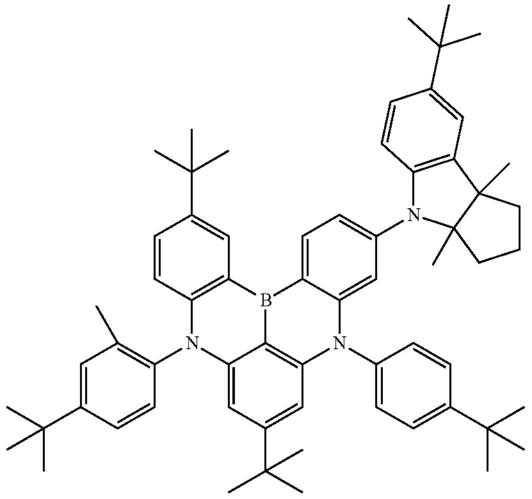
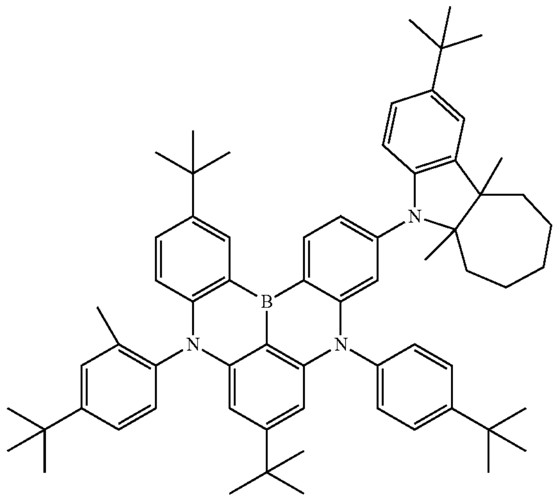
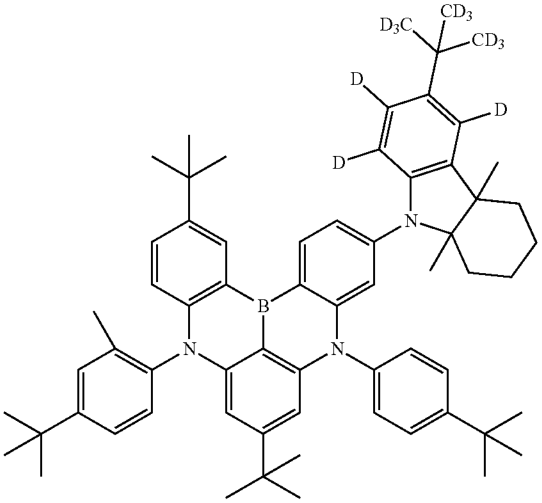
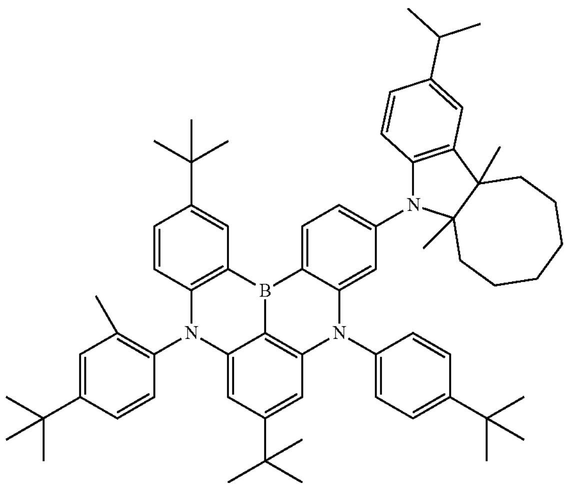
-continued -continued
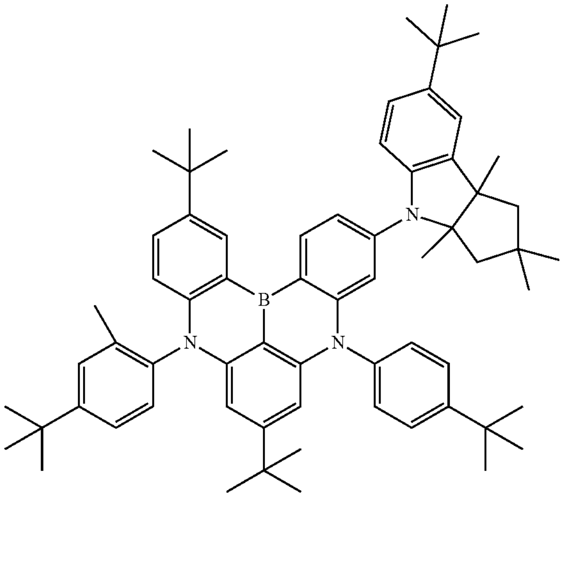
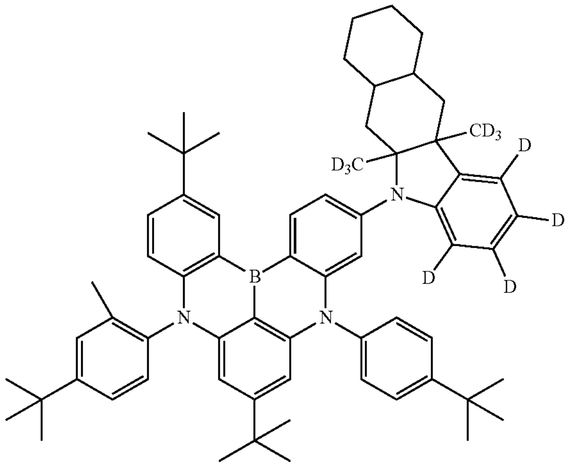
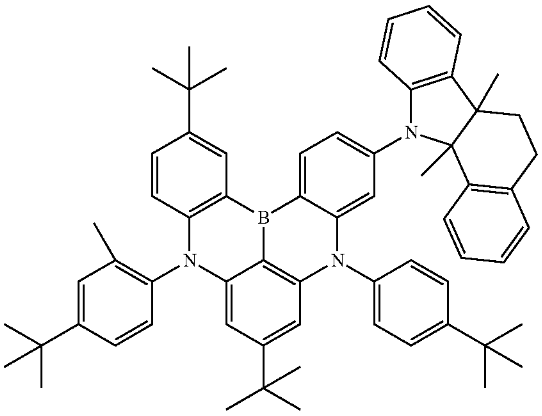
-continued
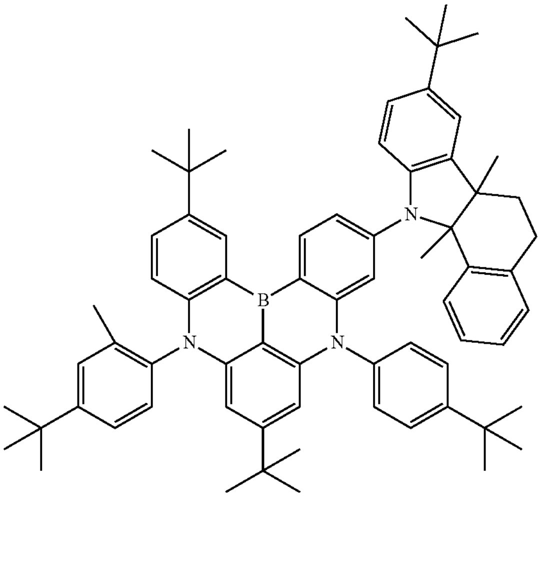
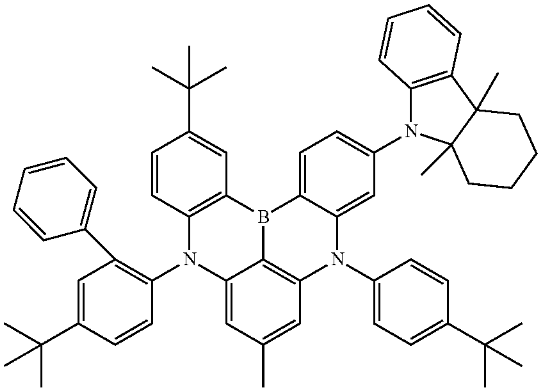
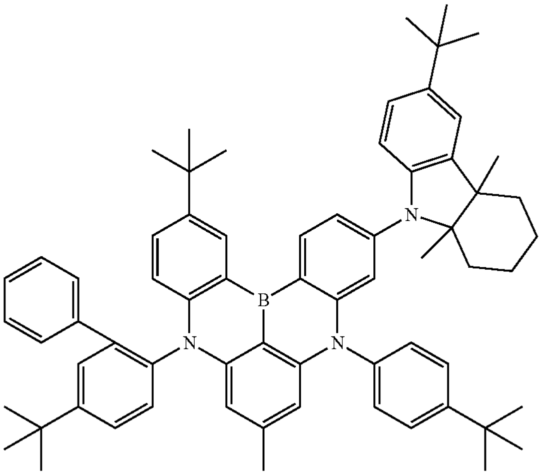

-continued
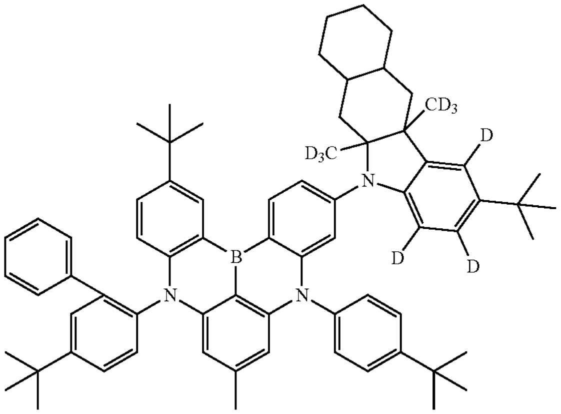
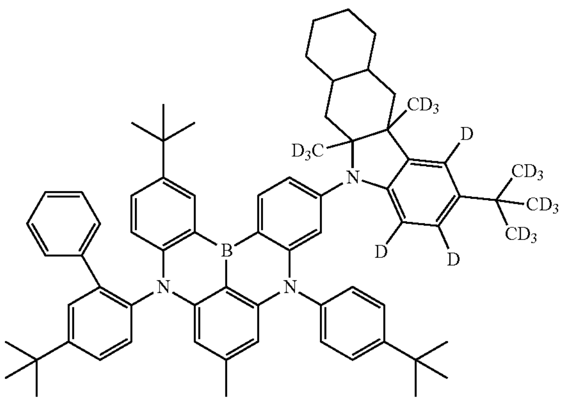
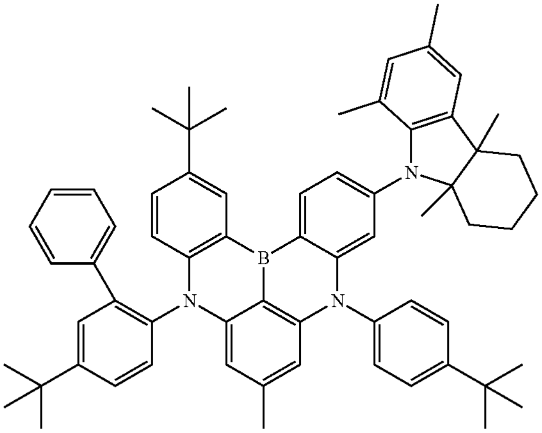
-continued
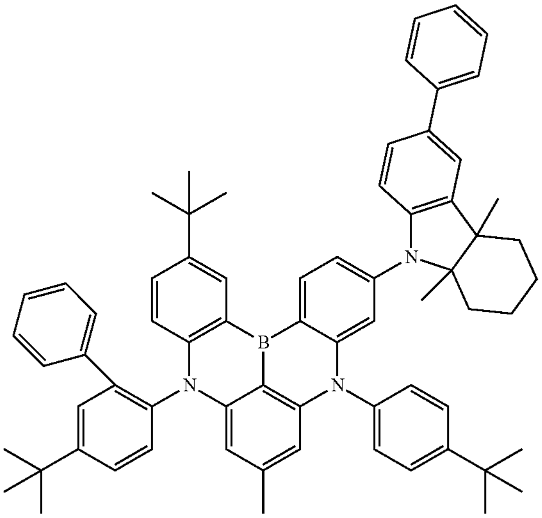
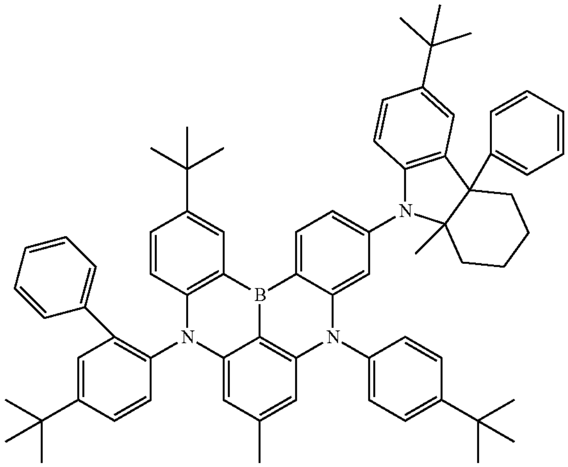
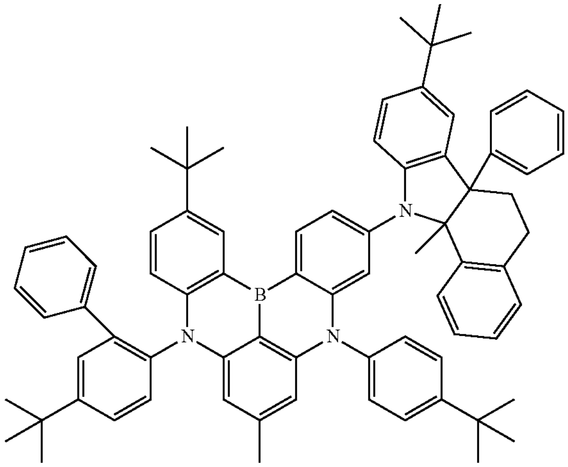

-continued
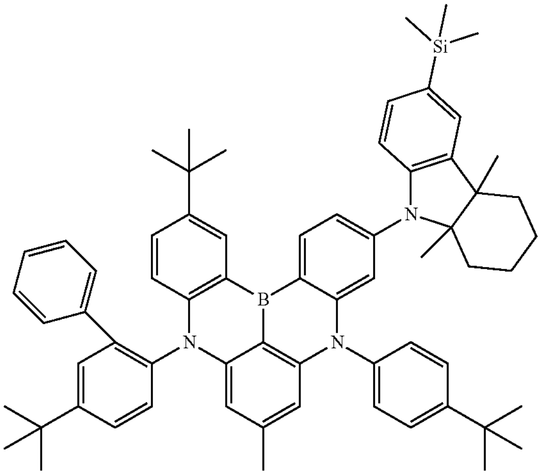
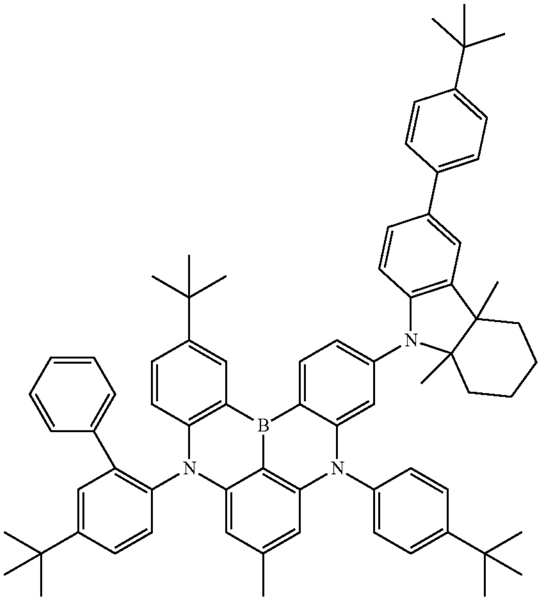
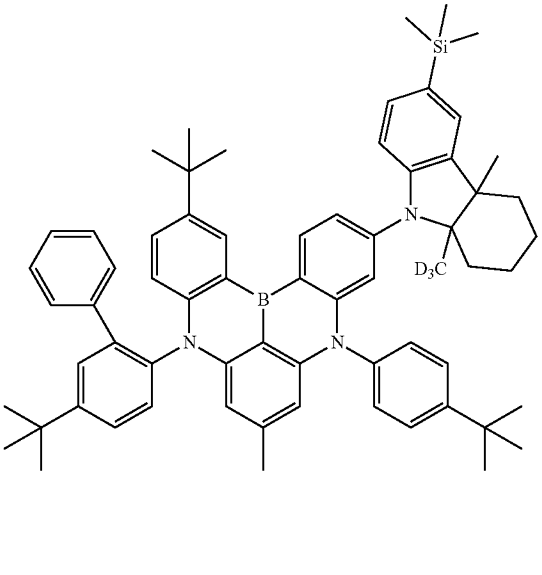
-continued
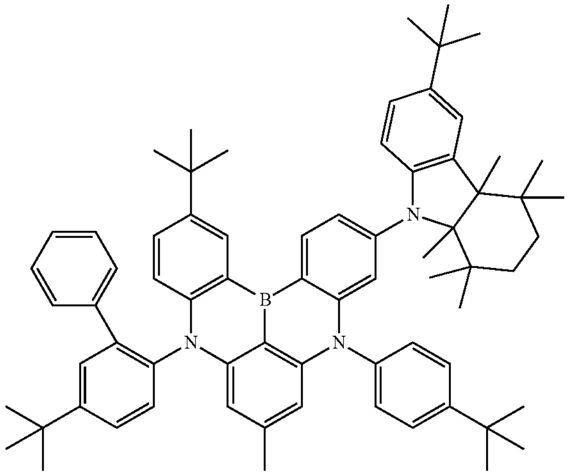
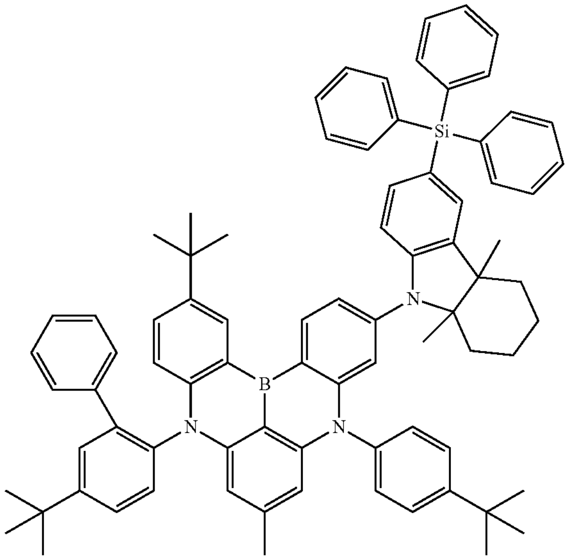
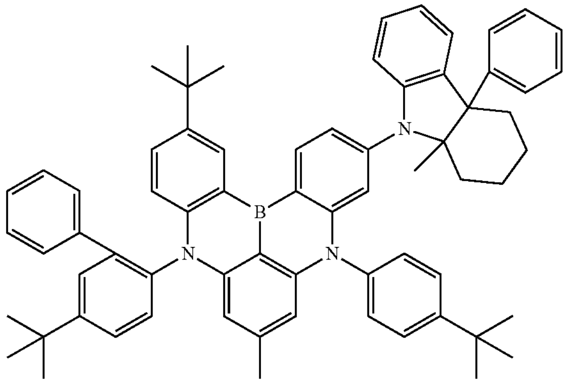

-continued
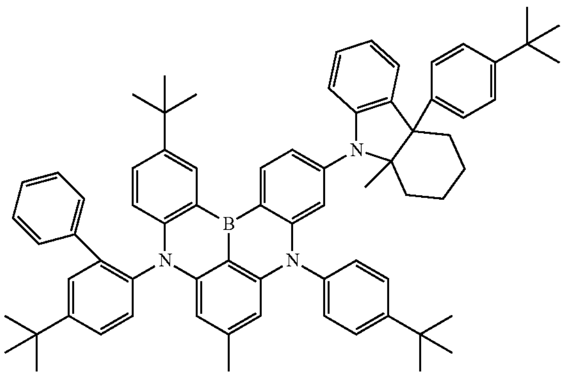
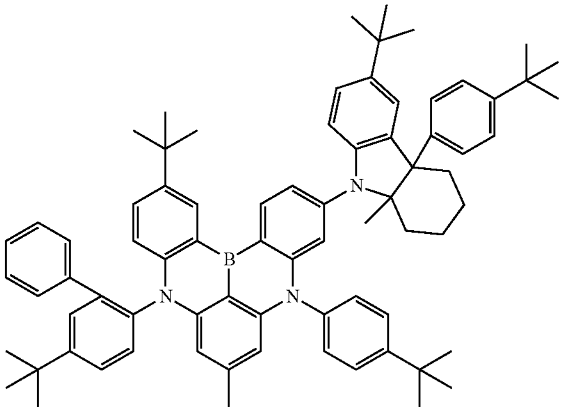
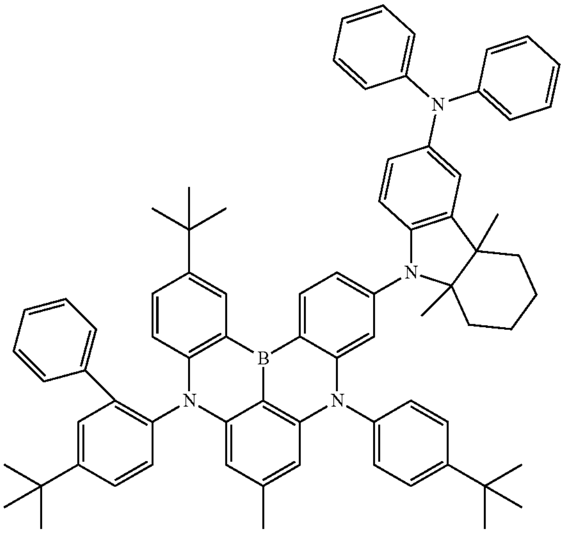
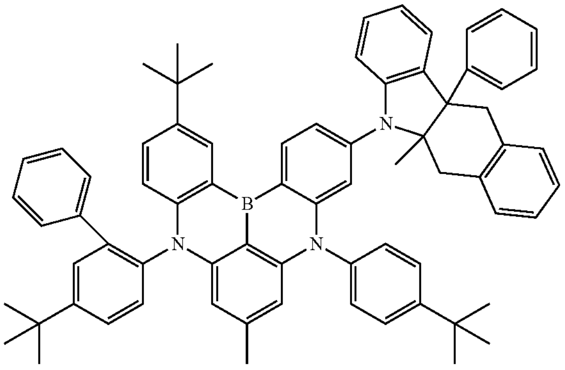
-continued
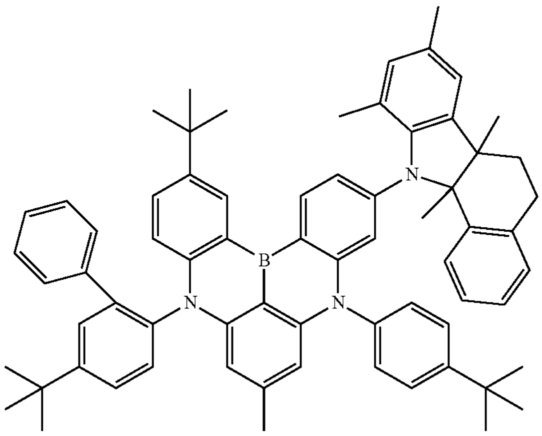
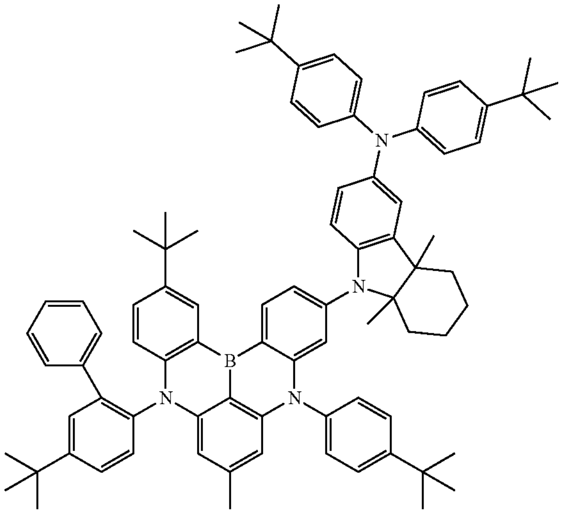
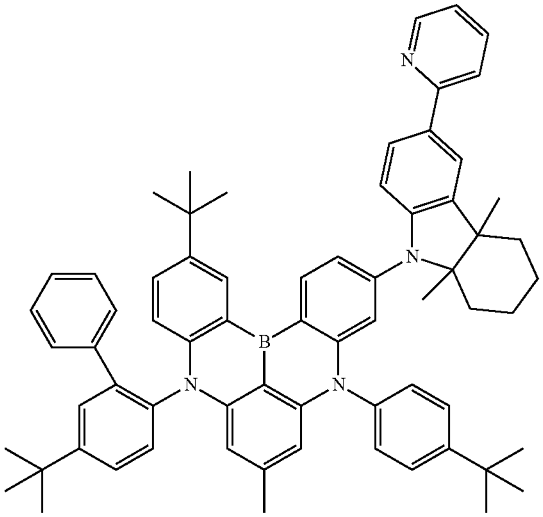

-continued
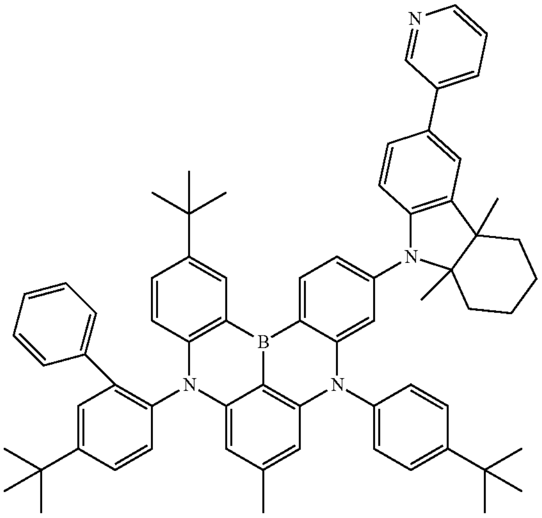
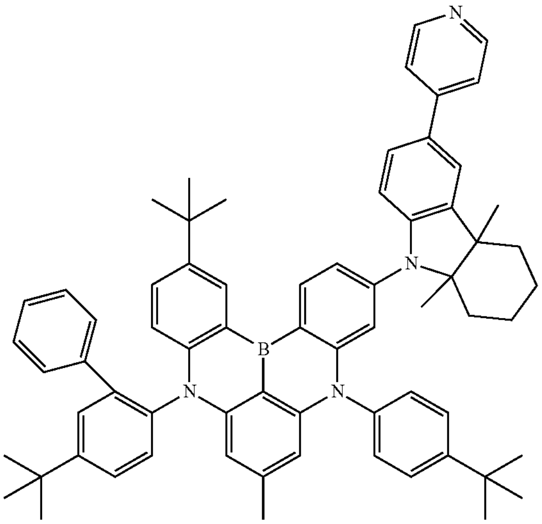
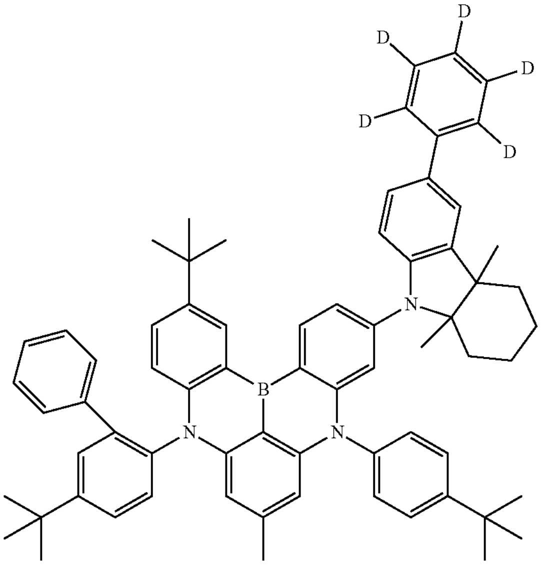
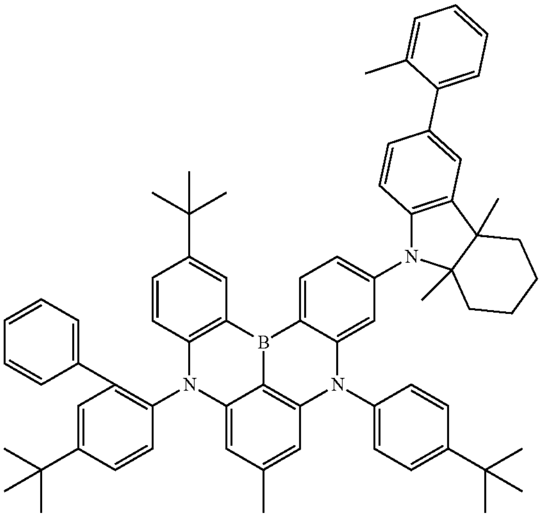
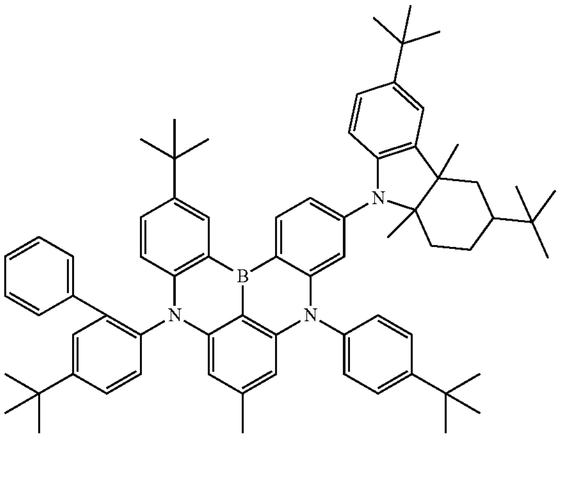
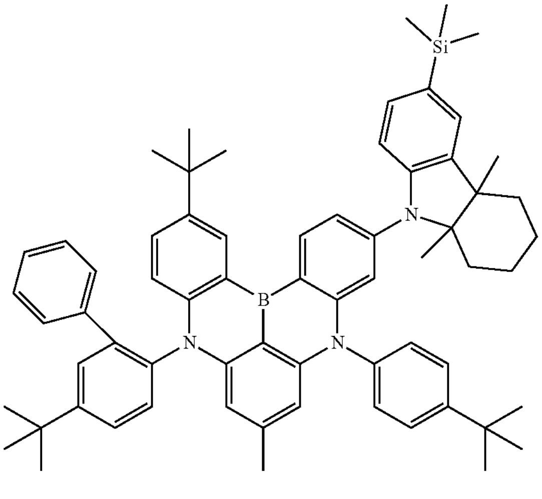
-continued -continued
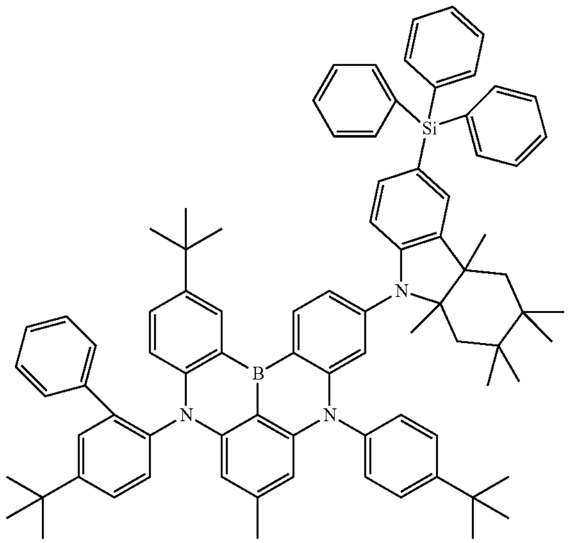
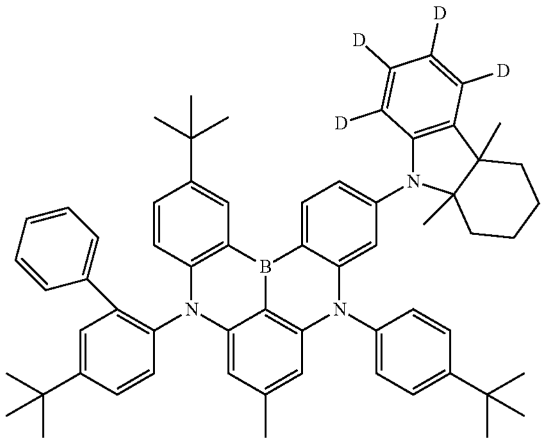
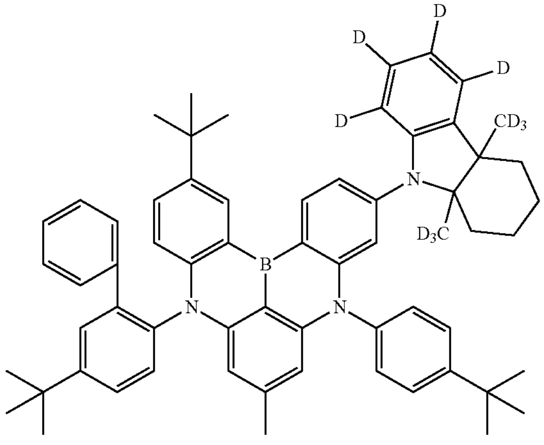
-continued
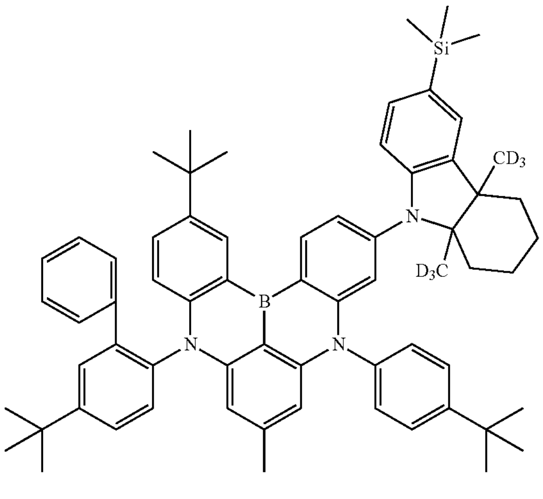
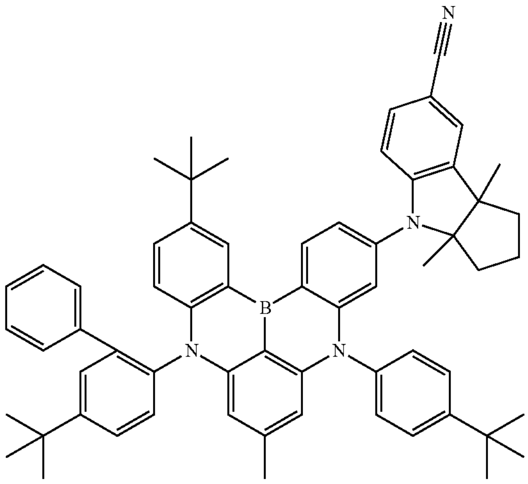
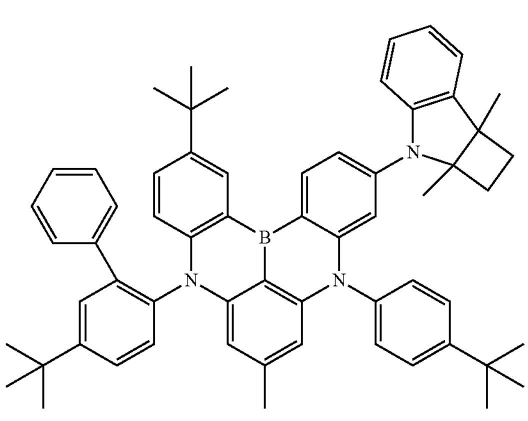

-continued
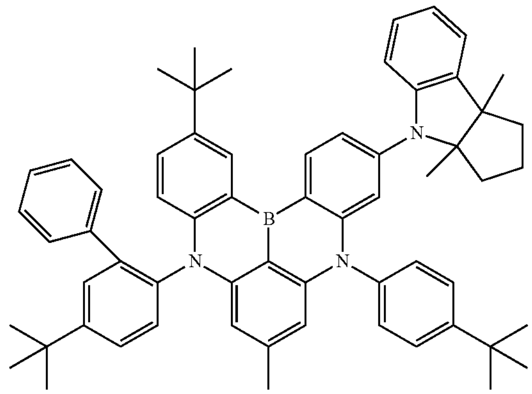
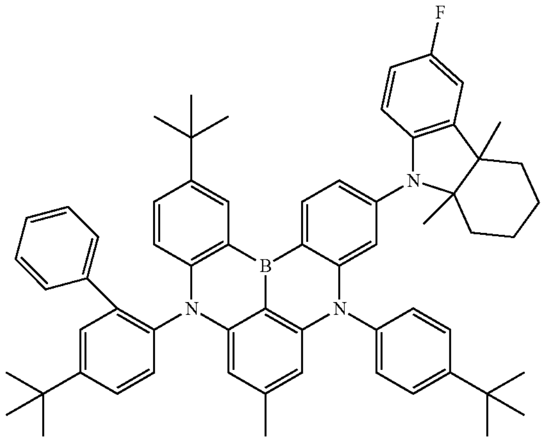
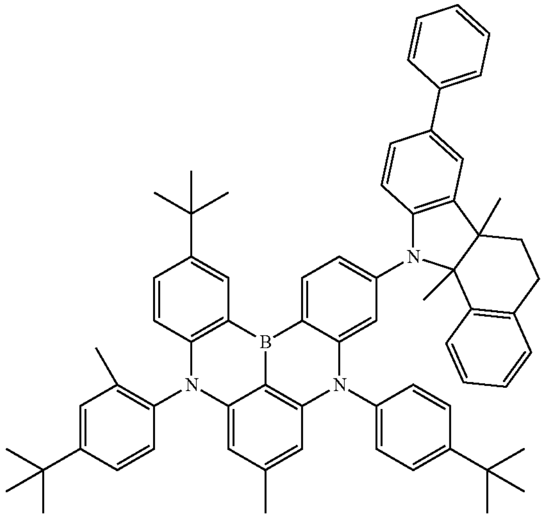
-continued
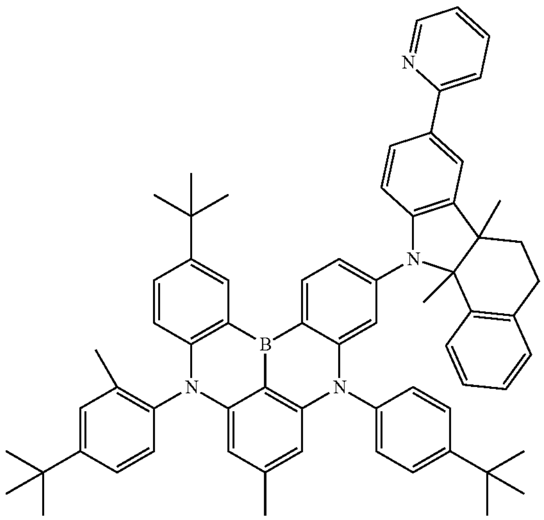
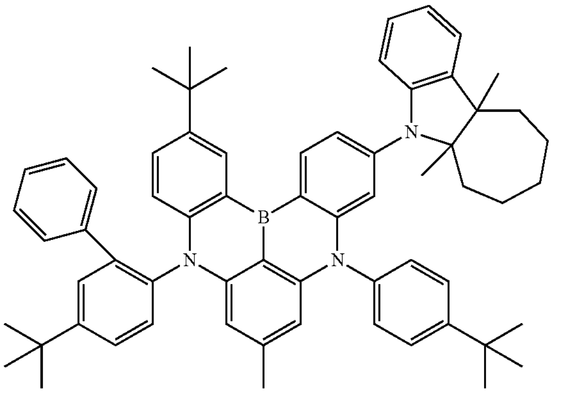
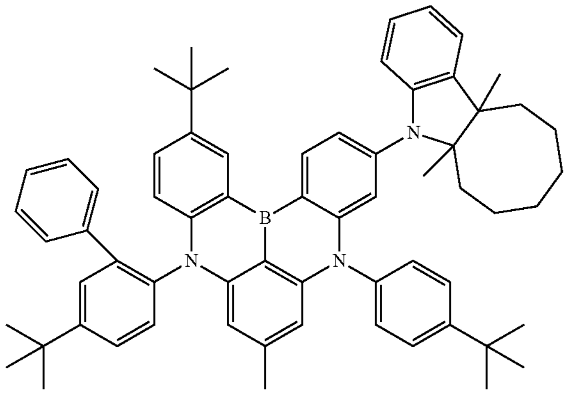

-continued
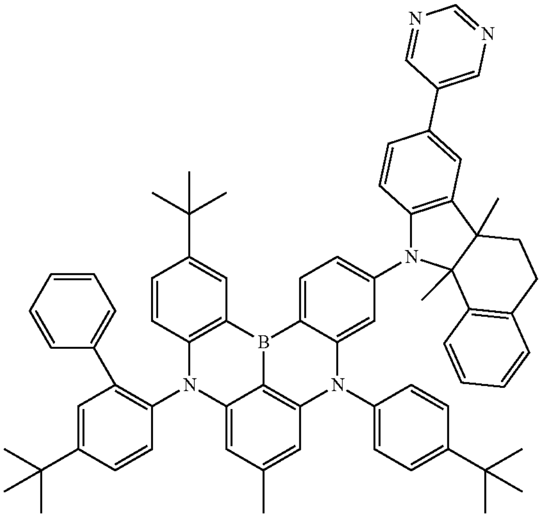
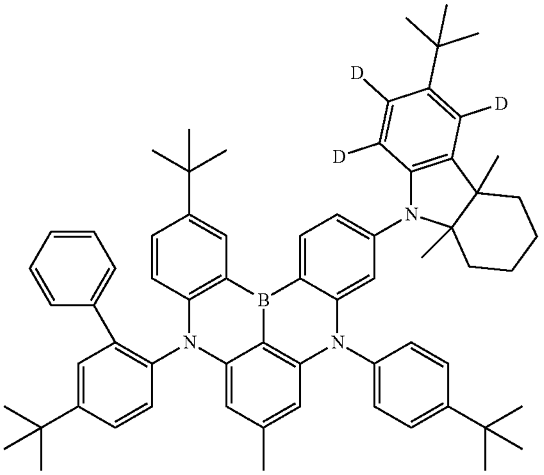
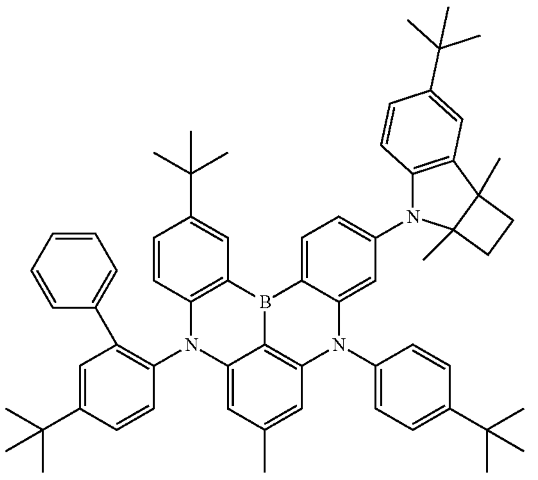
-continued
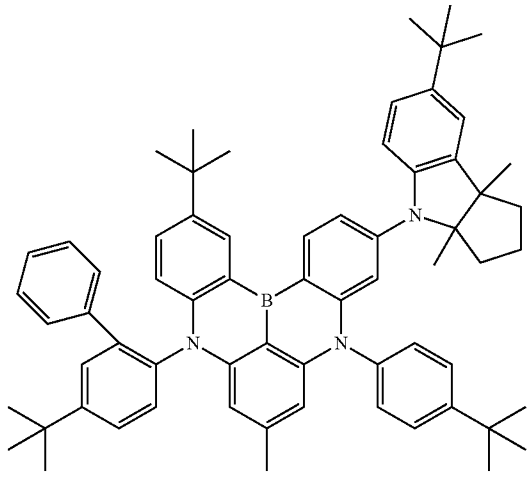
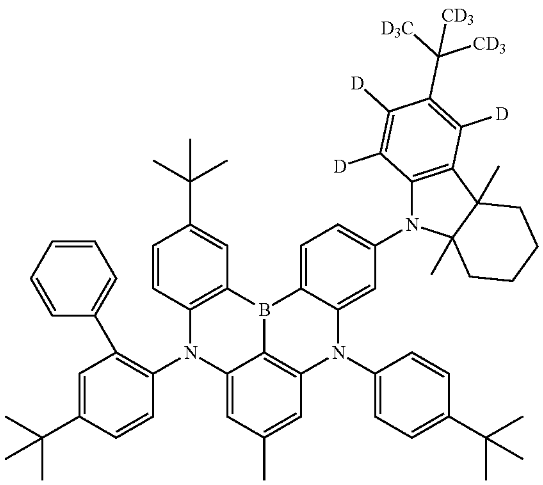
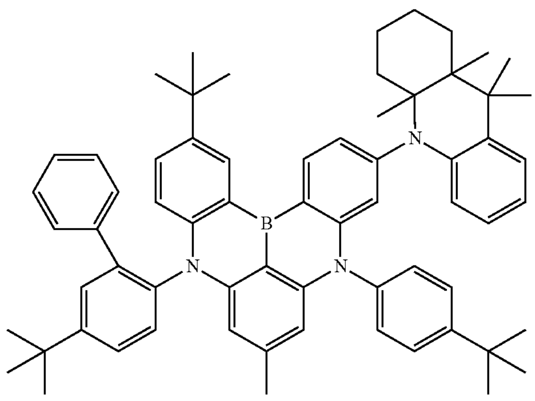

-continued
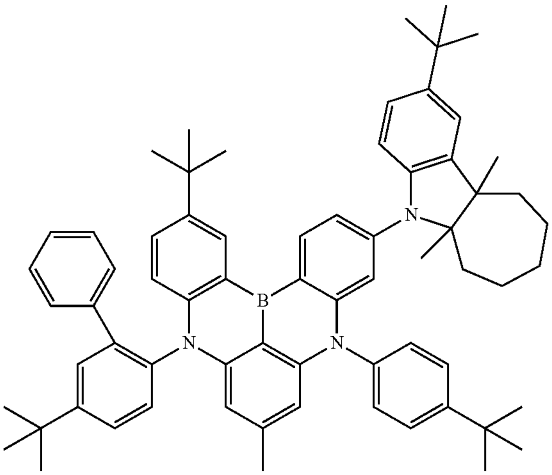
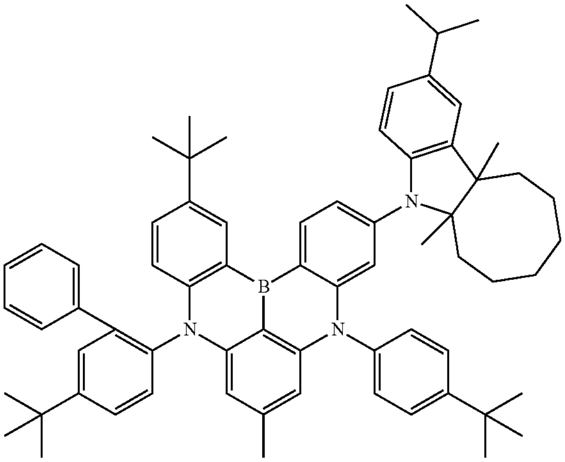
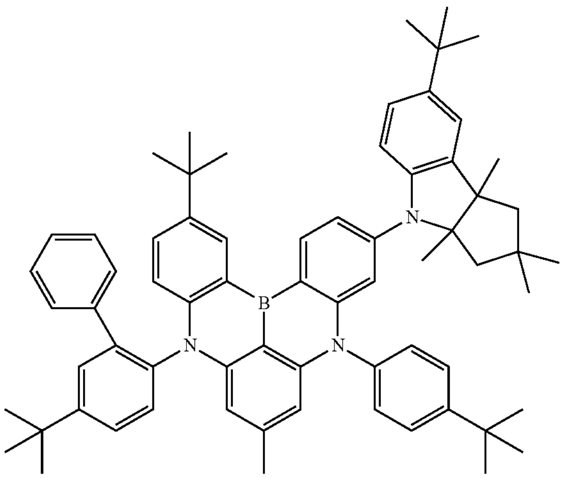
-continued
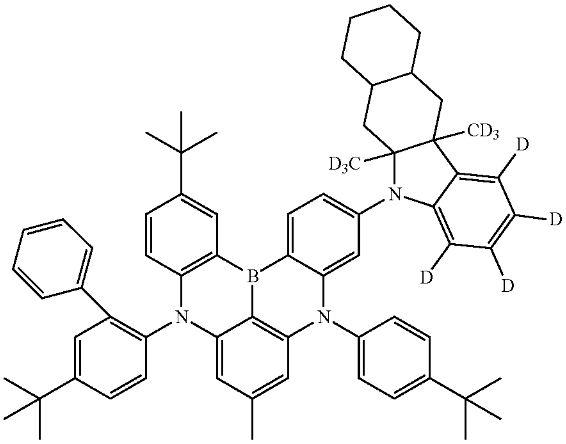
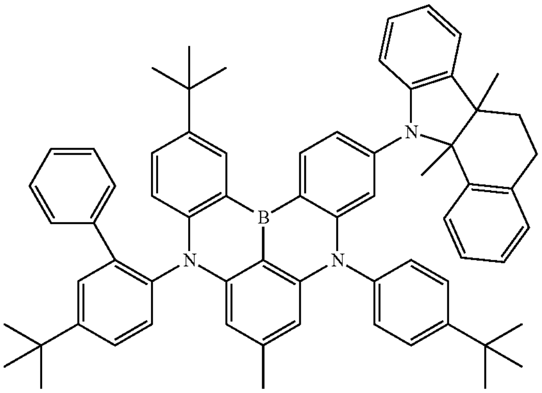
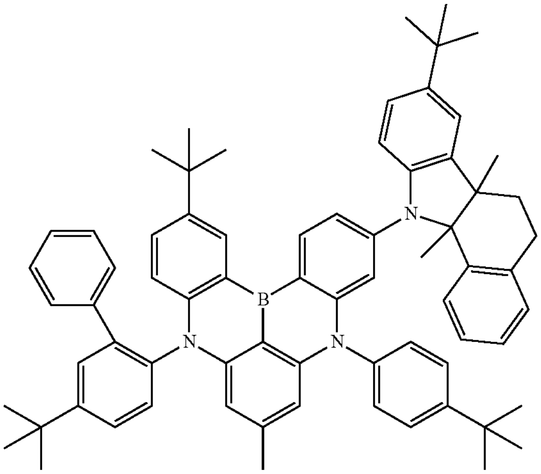
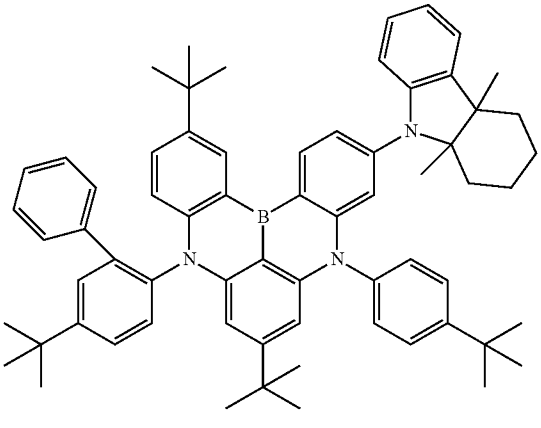

-continued
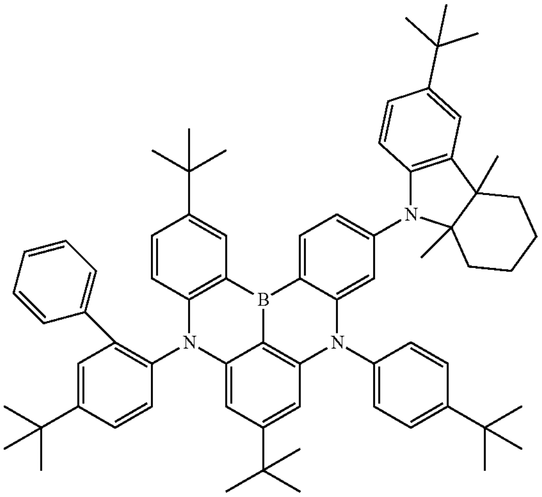
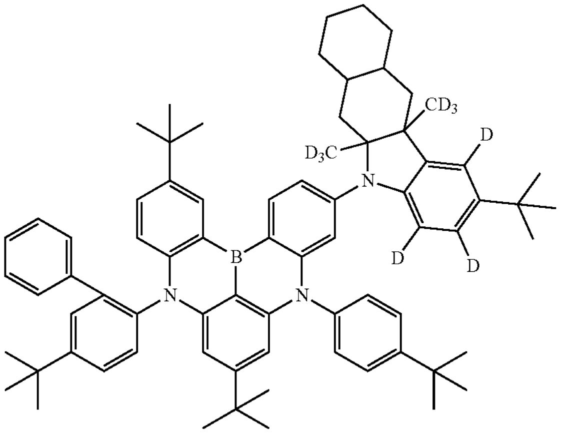
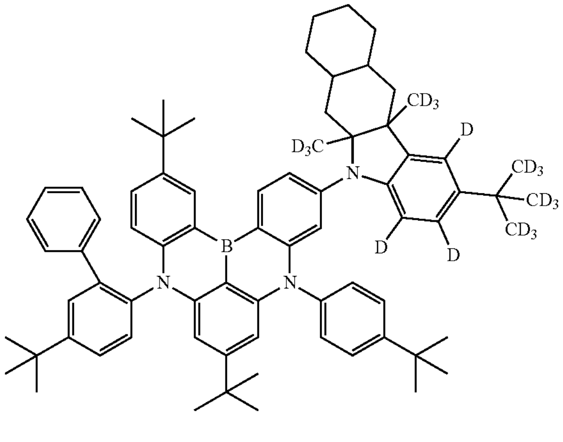
-continued
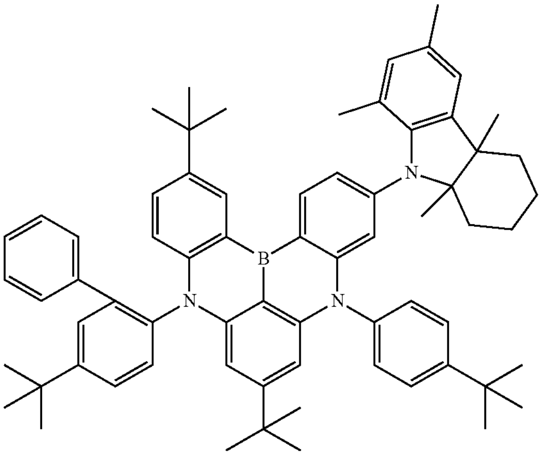
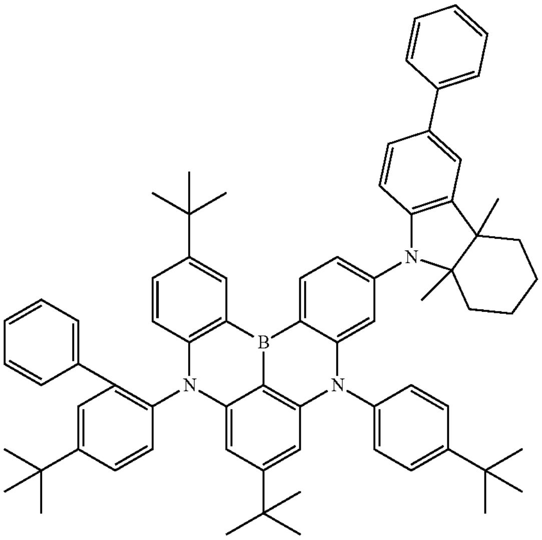
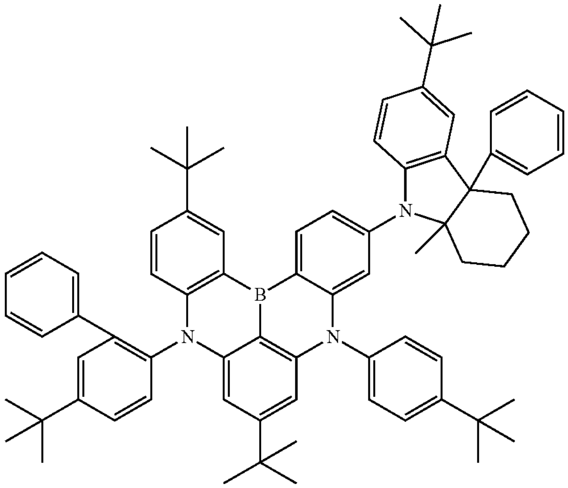

-continued
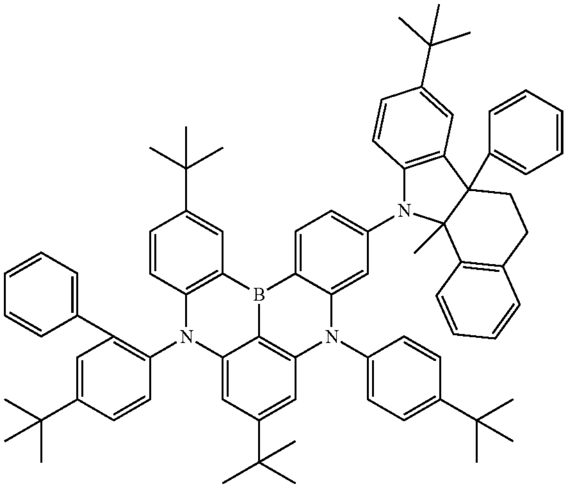
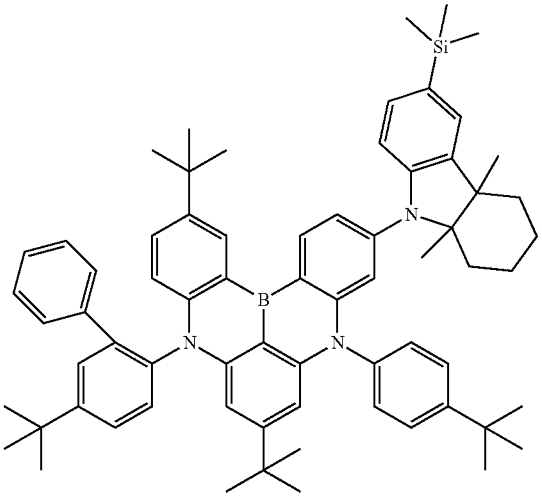
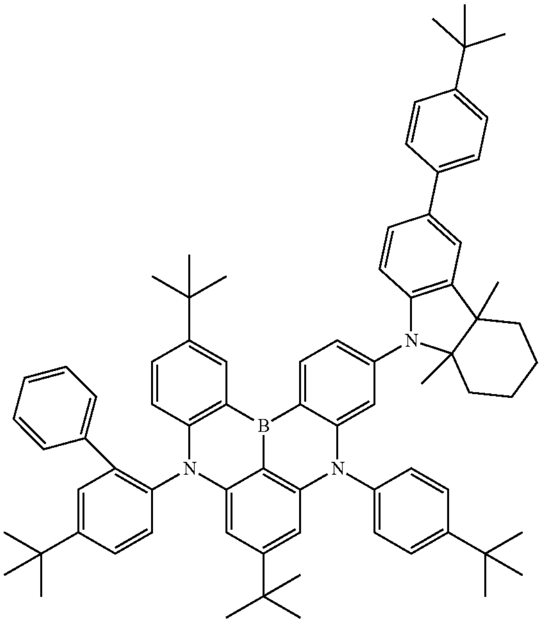
-continued
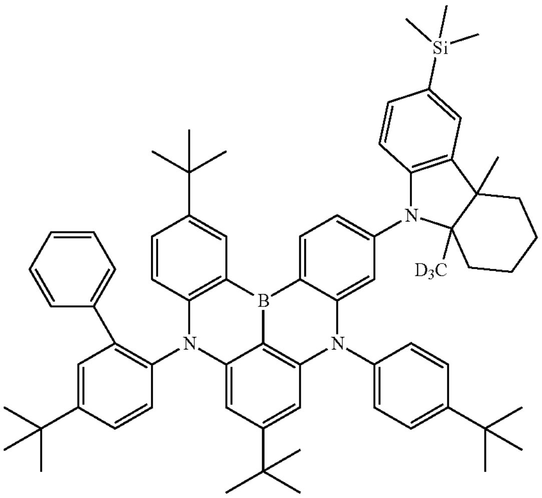
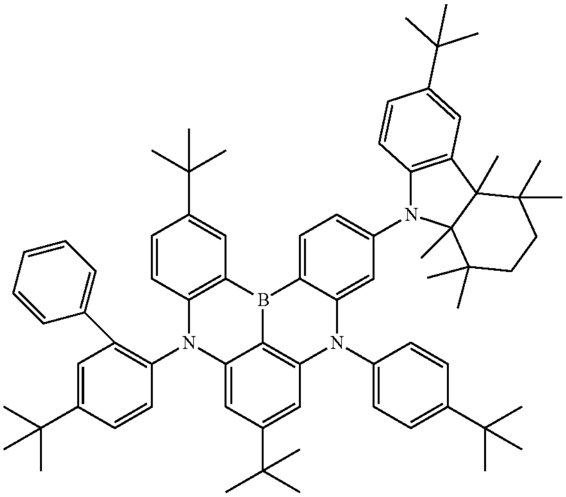
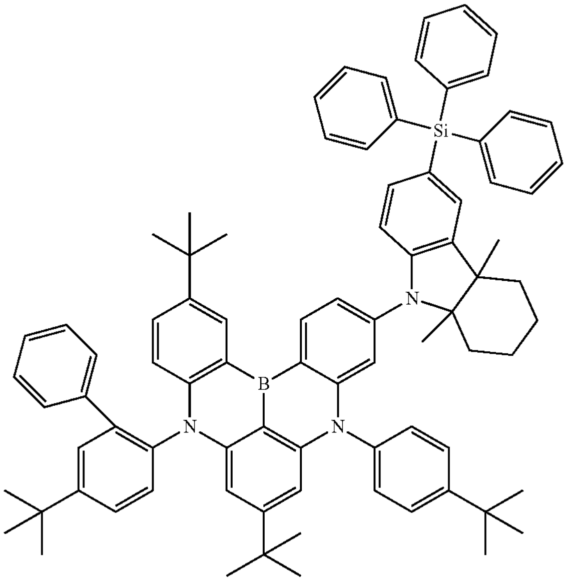

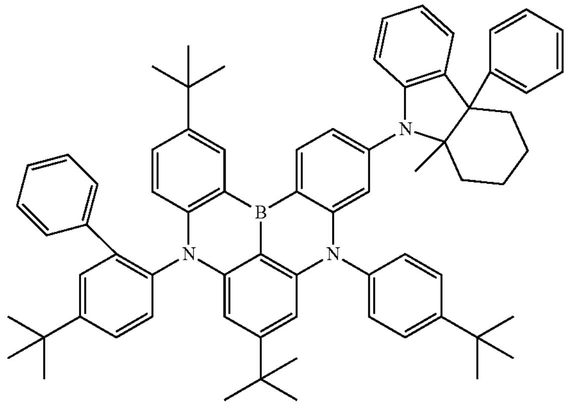
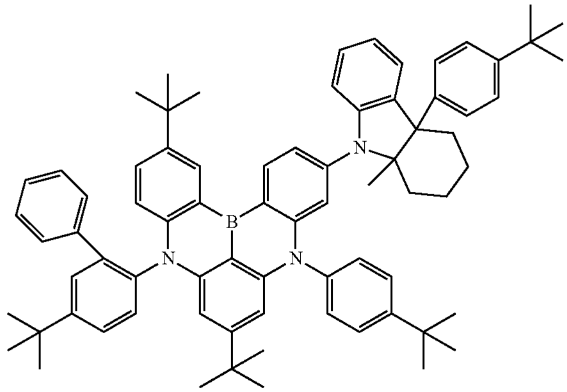
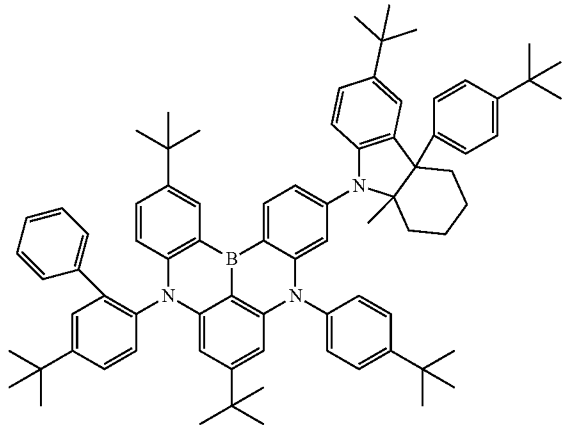
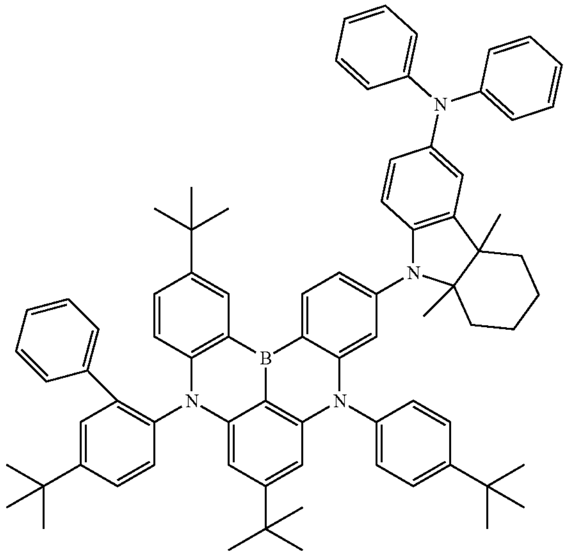
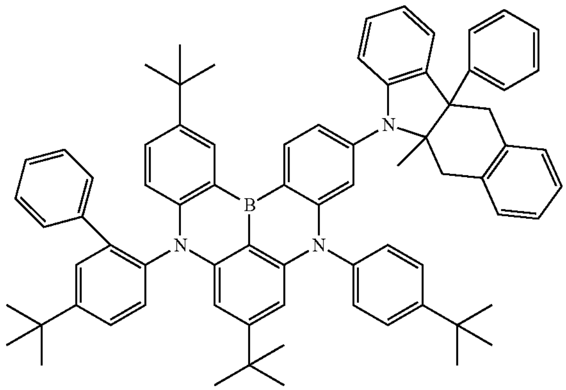
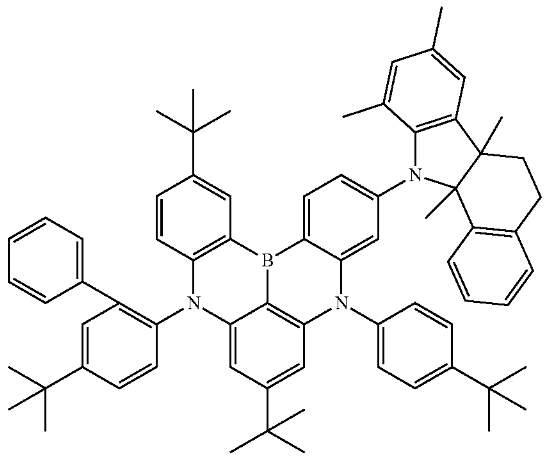

-continued
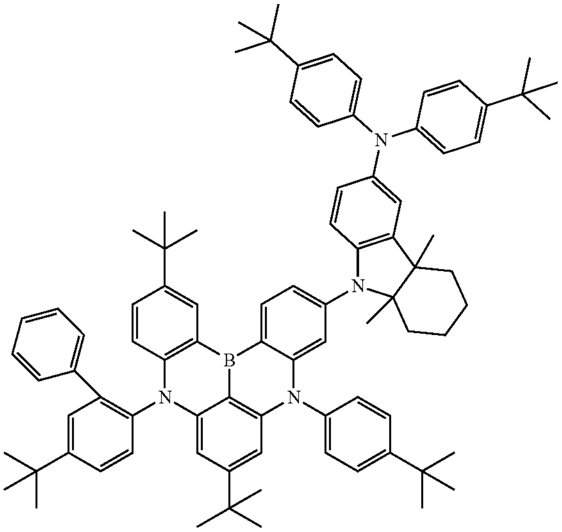
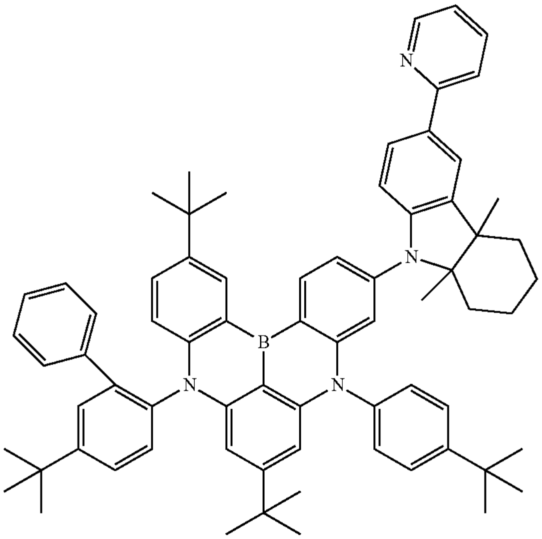
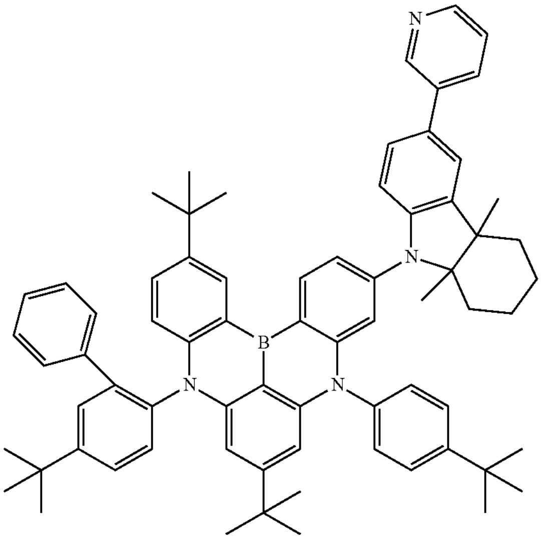
-continued
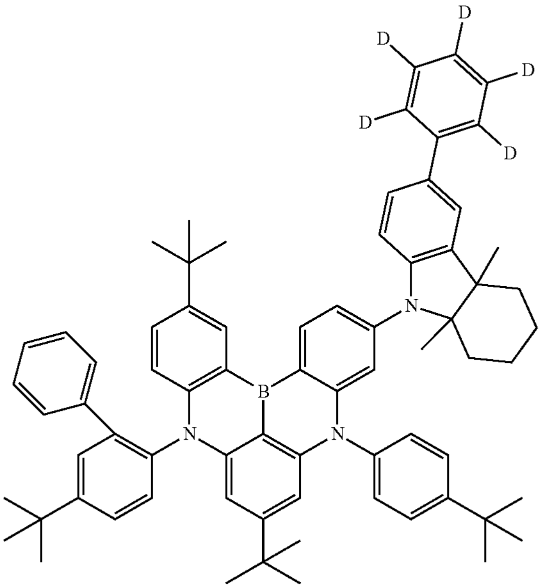
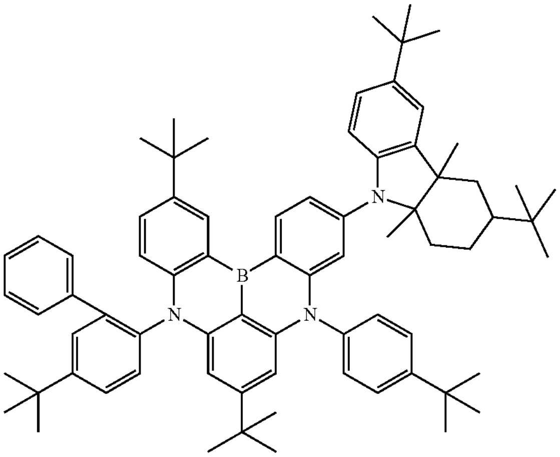
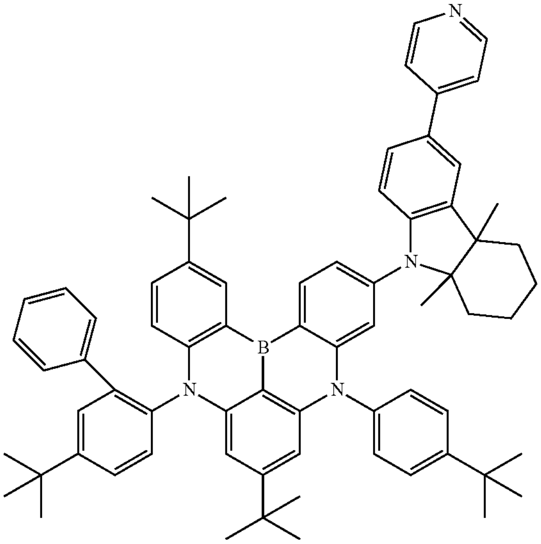

-continued
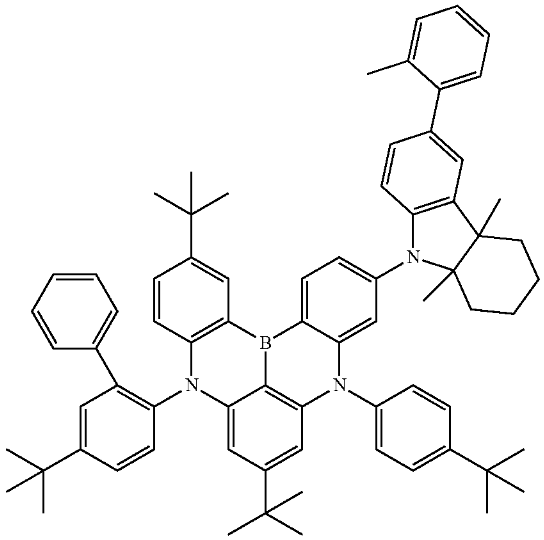
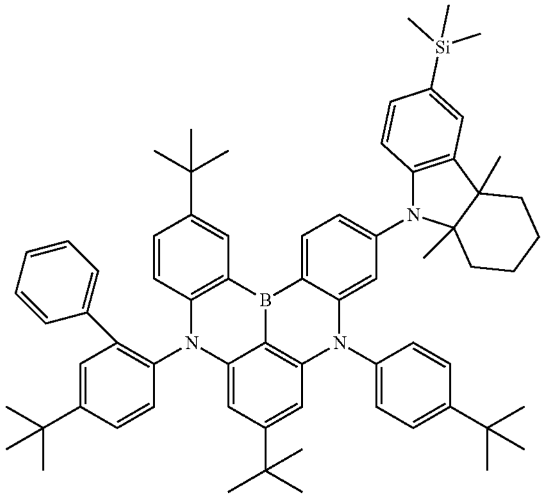
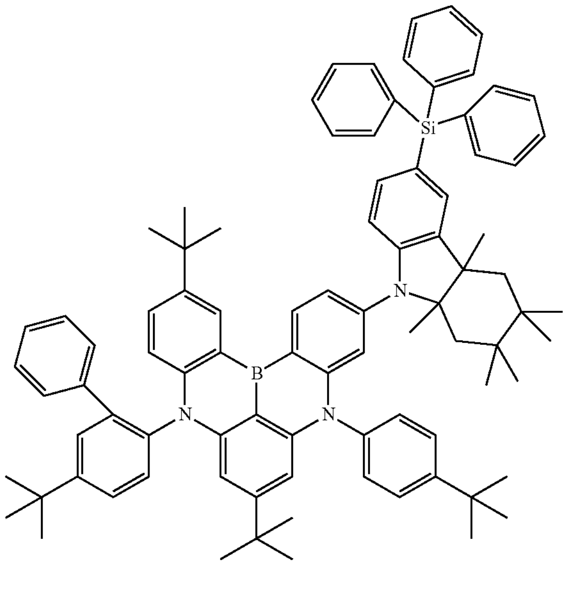
-continued
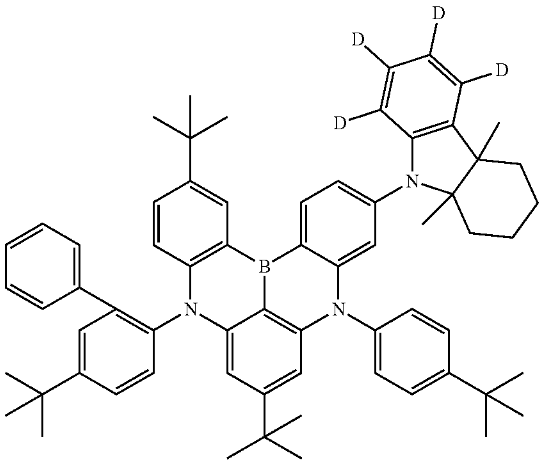
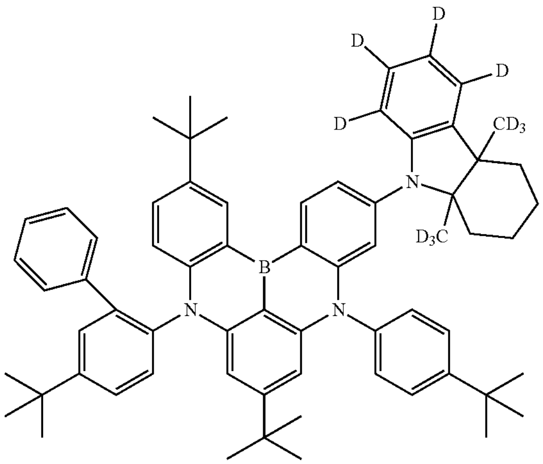
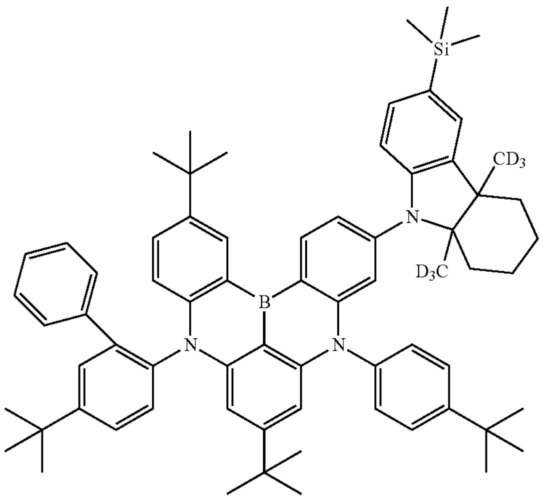

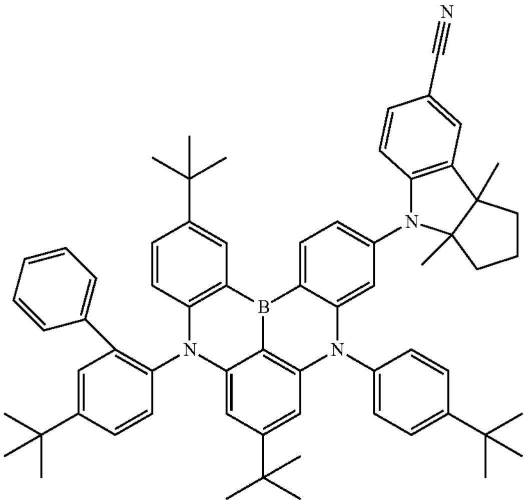
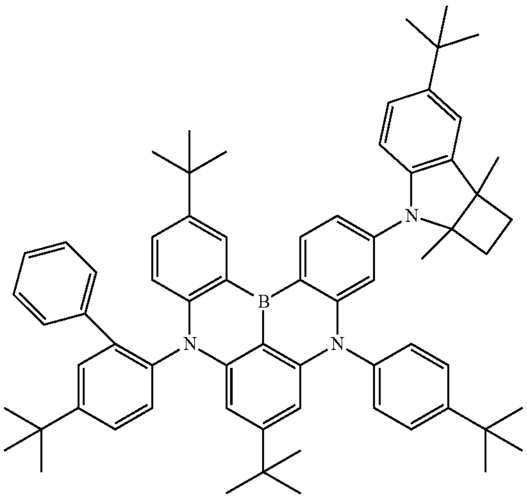
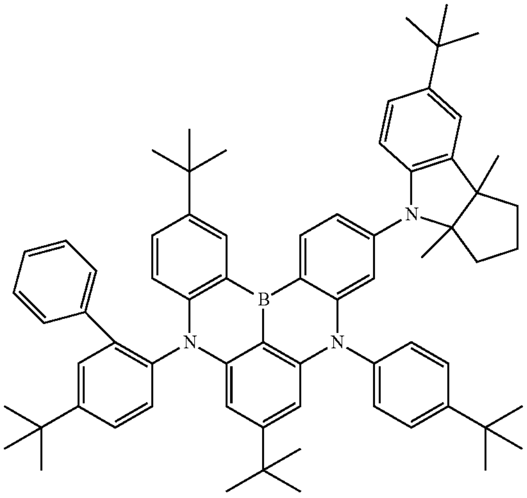
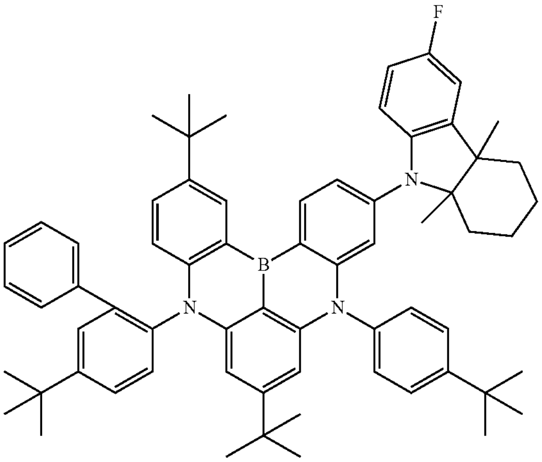
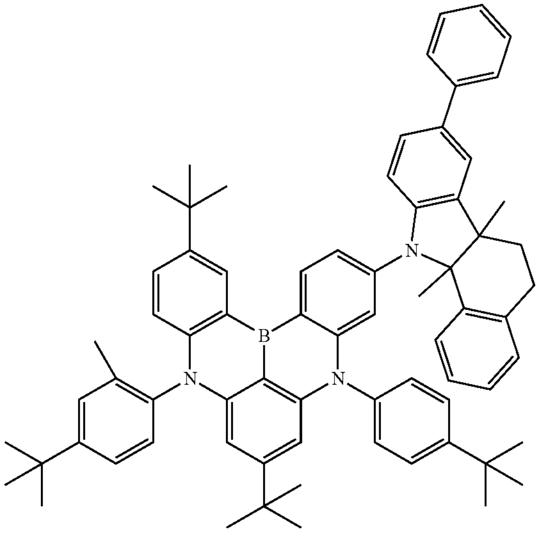
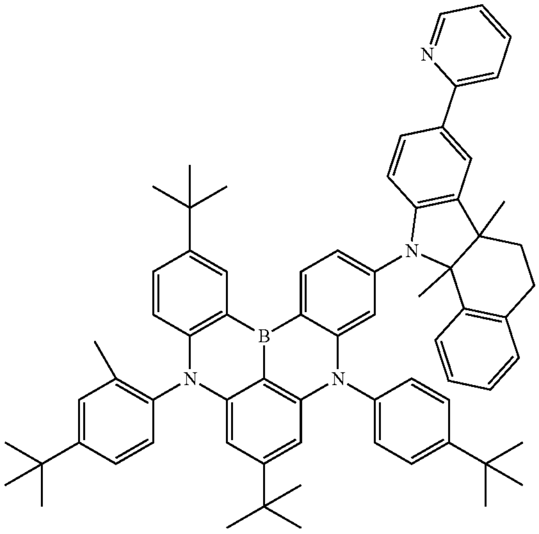

-continued
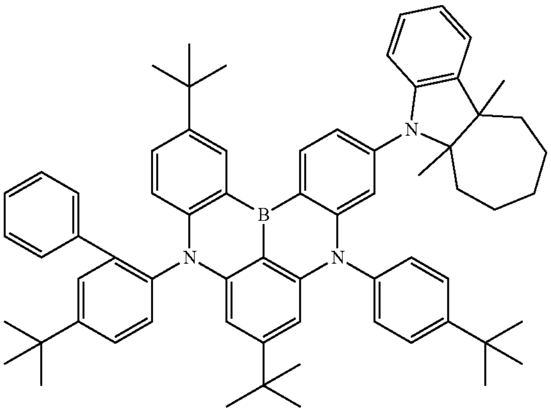
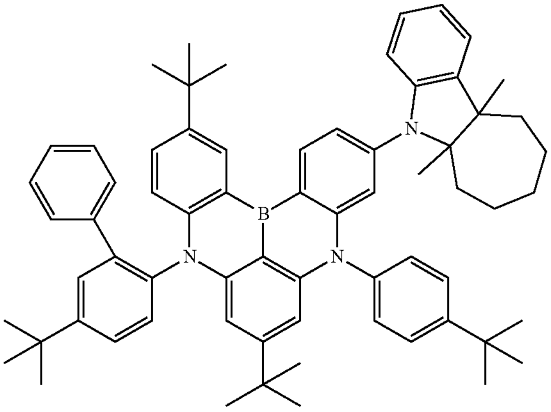
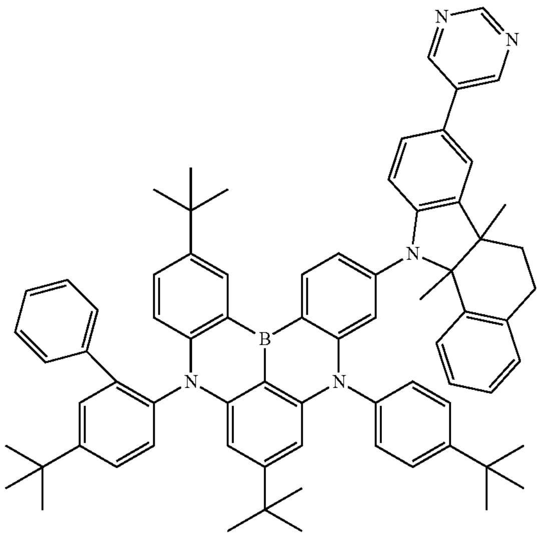
-continued
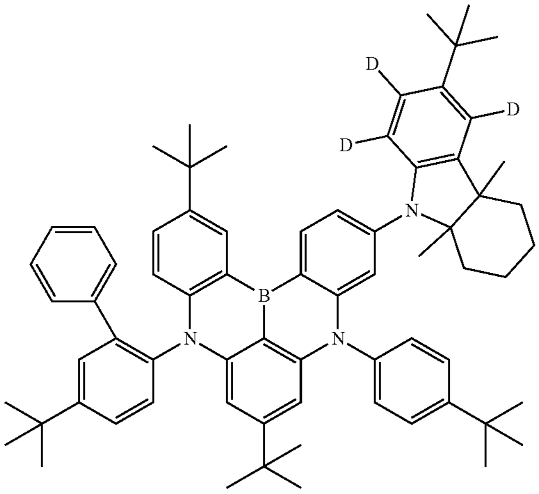
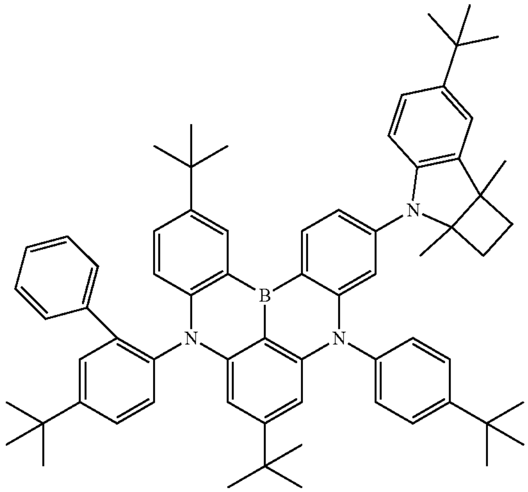
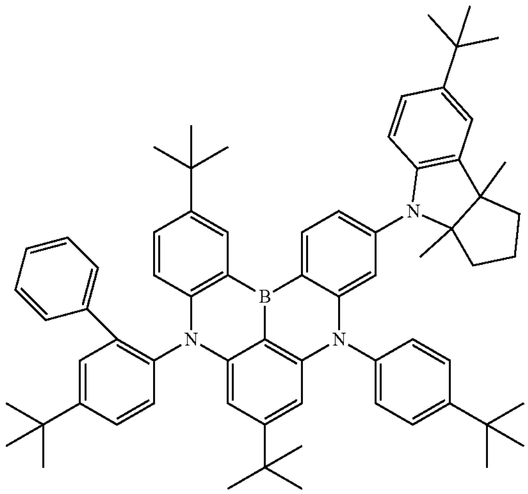

-continued
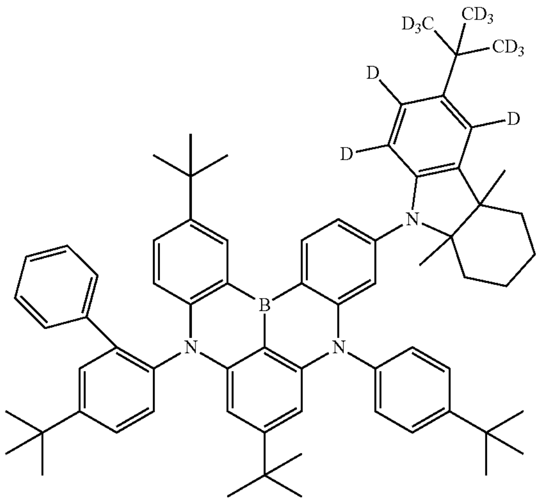
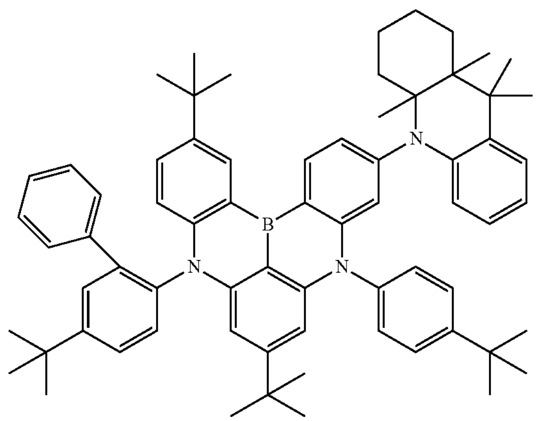
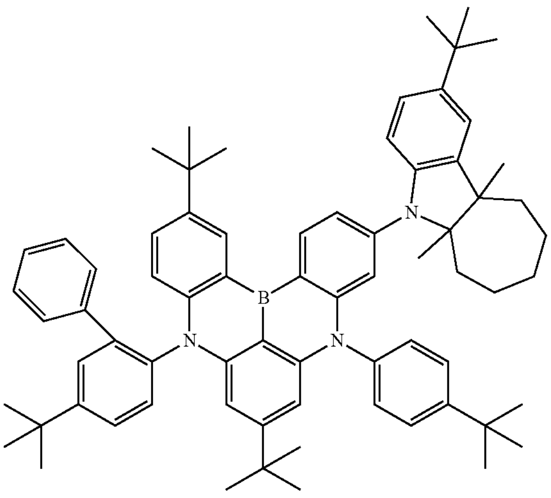
-continued
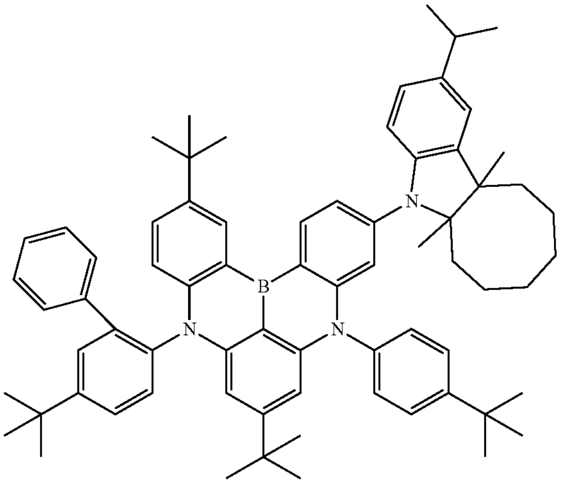
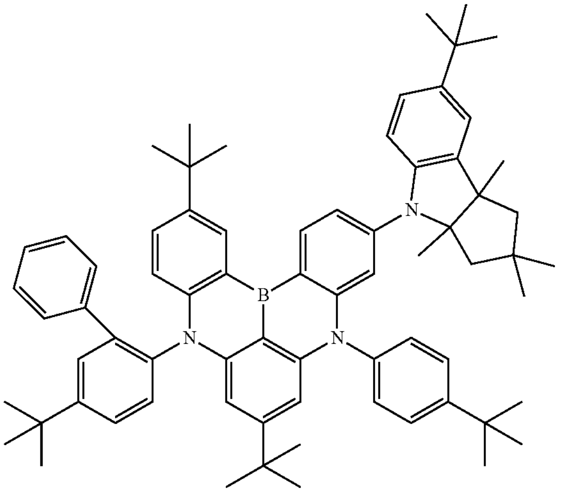
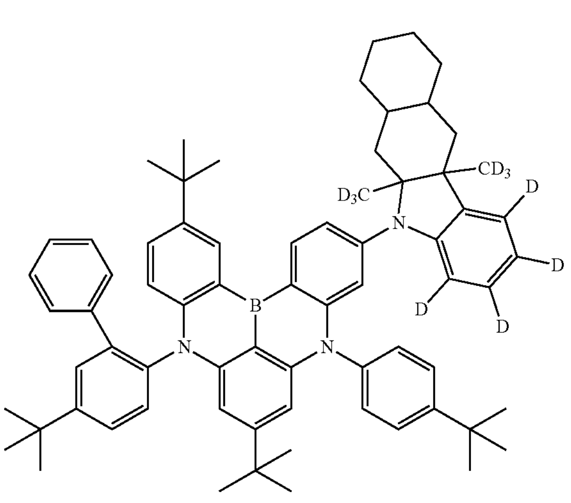

-continued
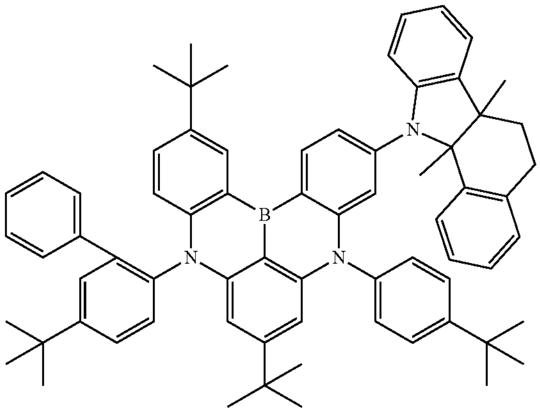
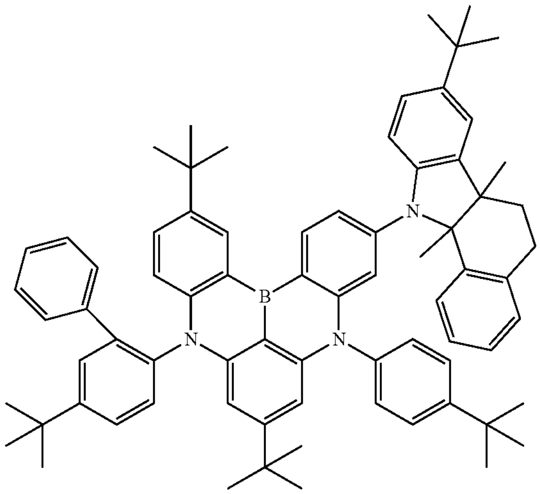
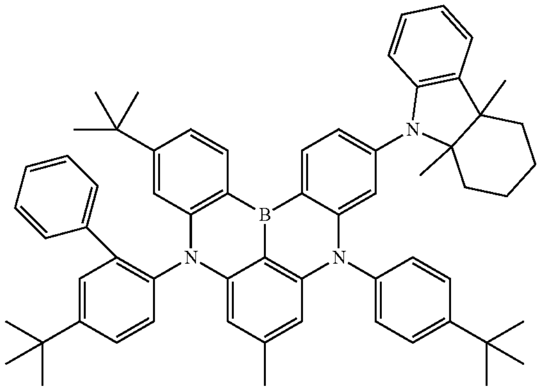
-continued
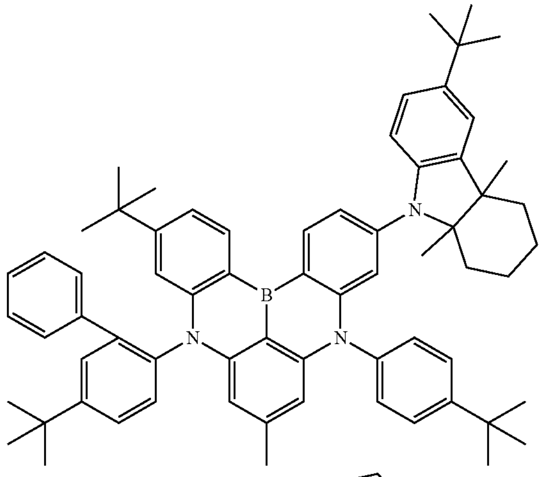
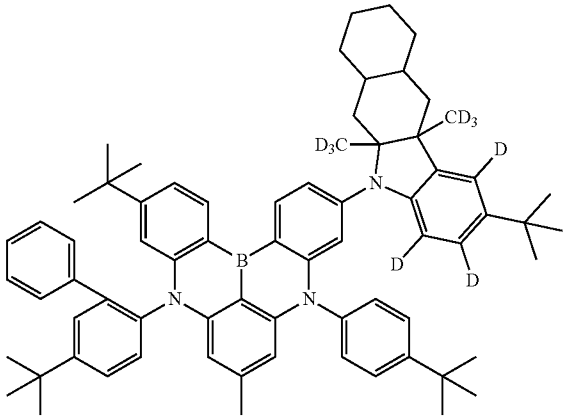
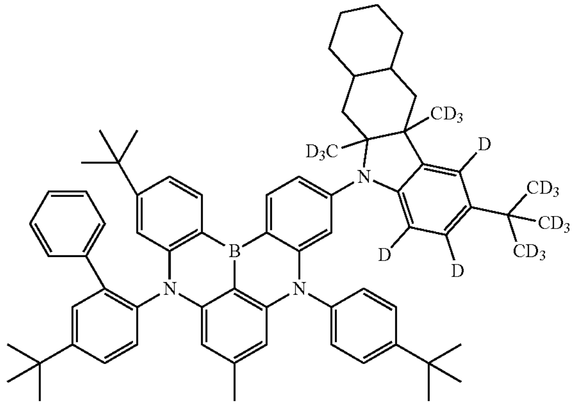
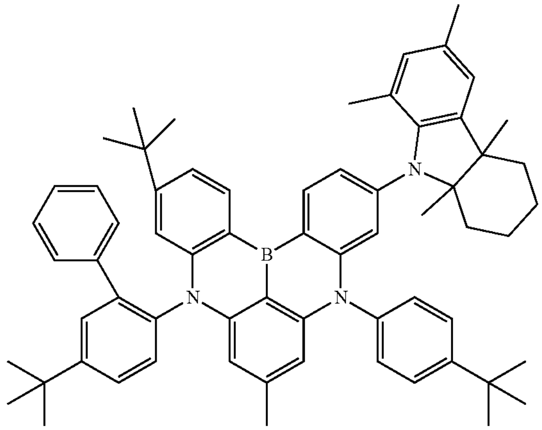

-continued
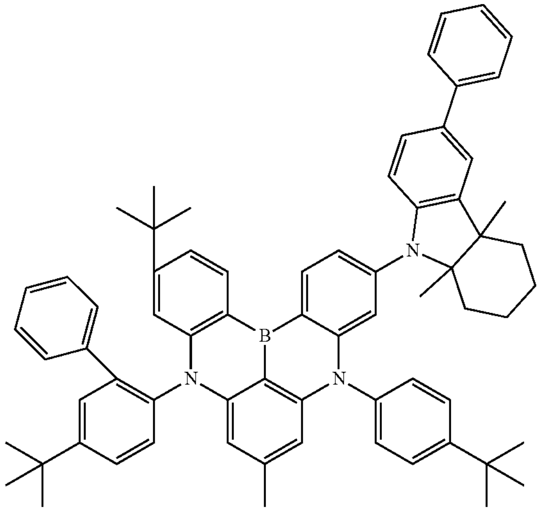
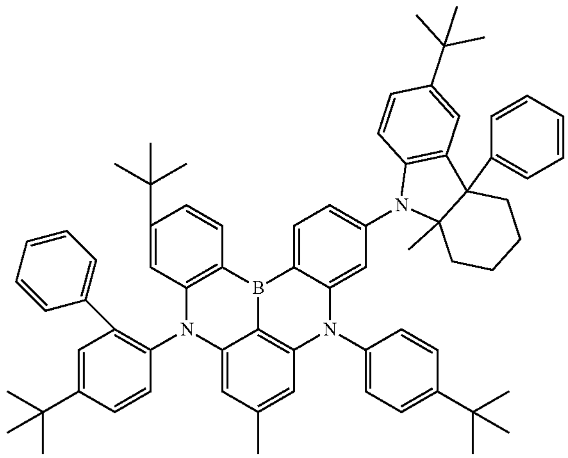
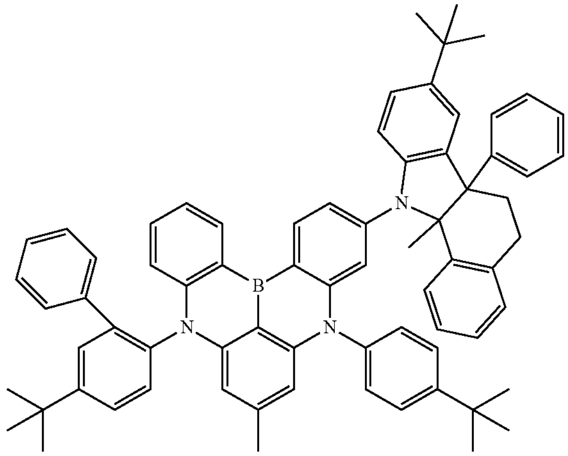
-continued
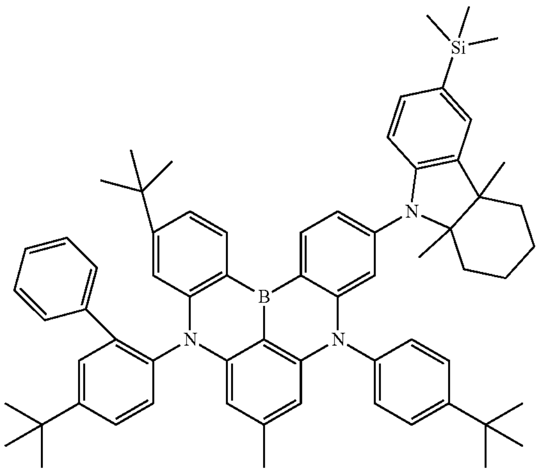
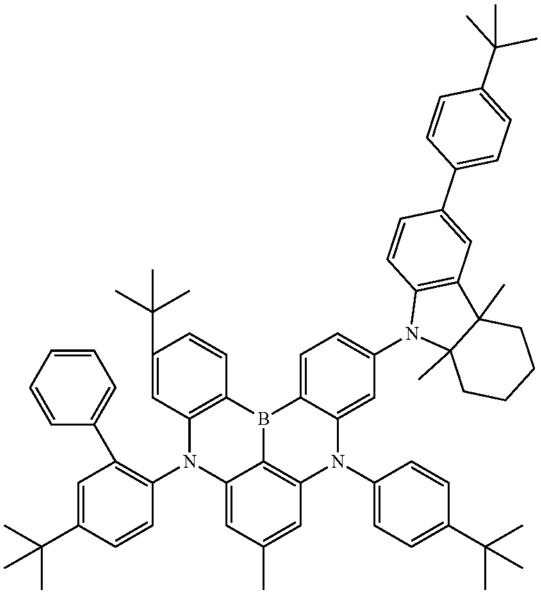
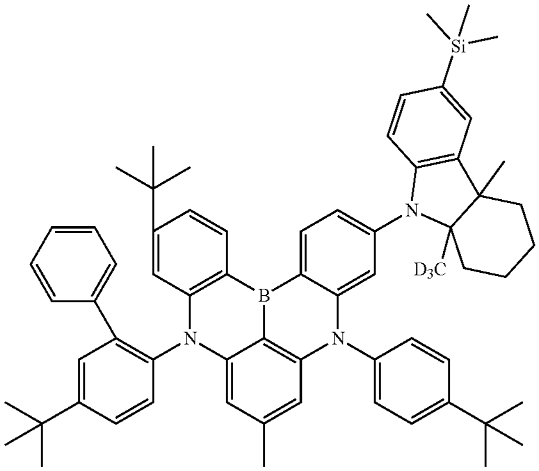

-continued
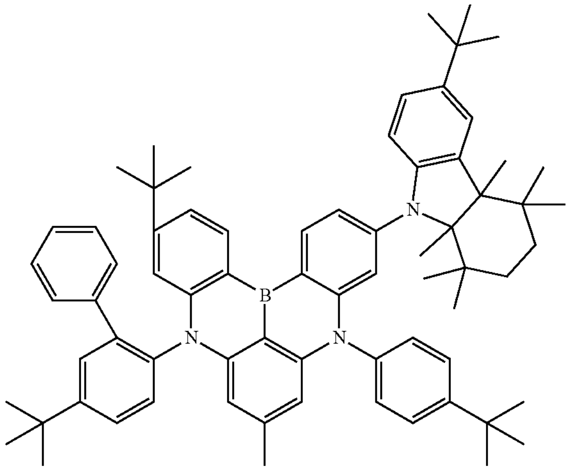
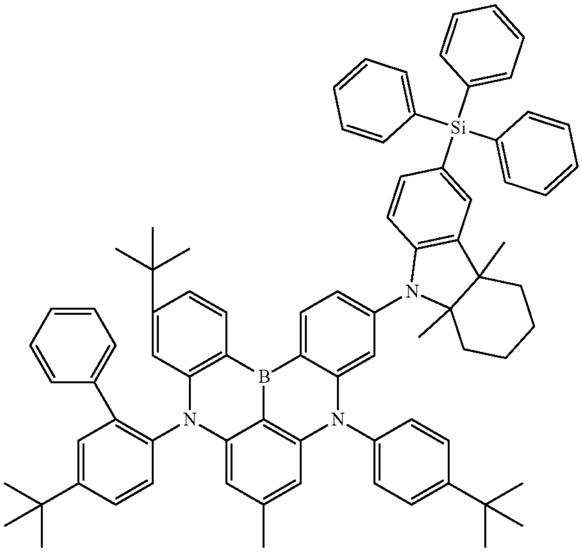
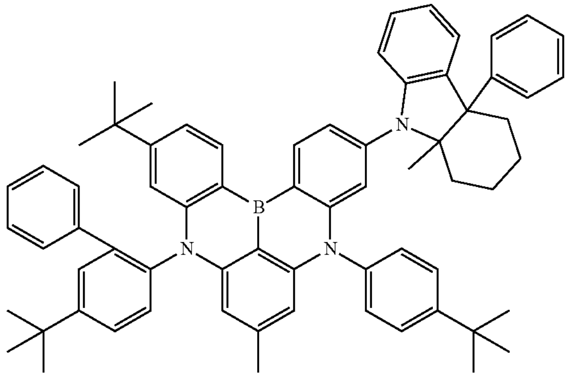
-continued
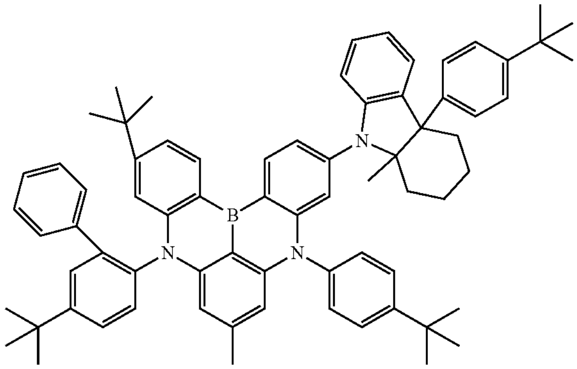
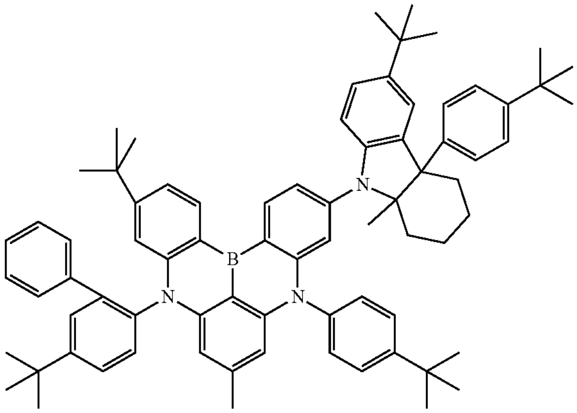
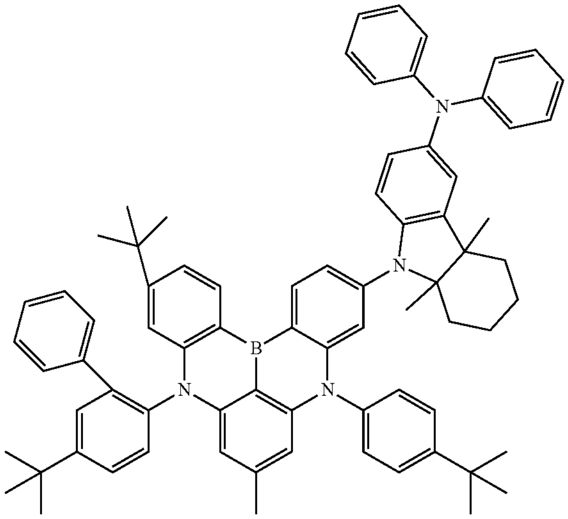
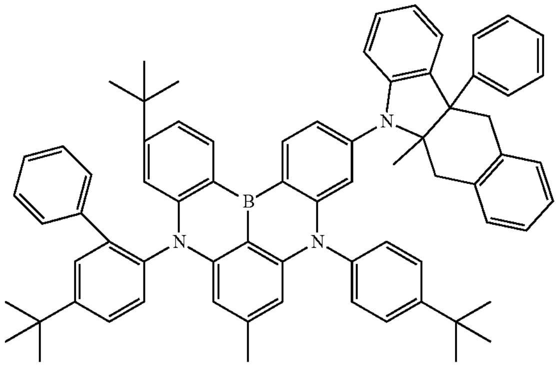

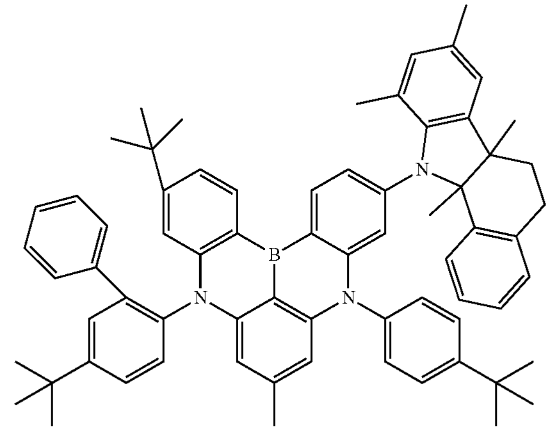
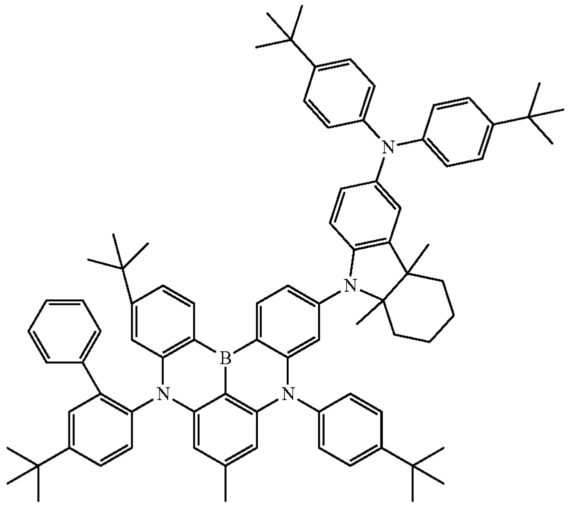
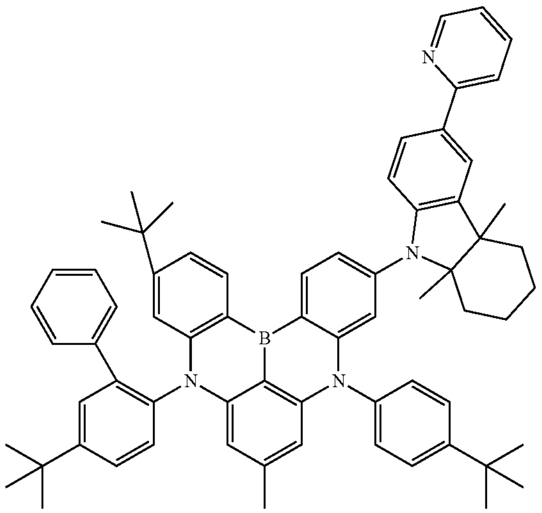
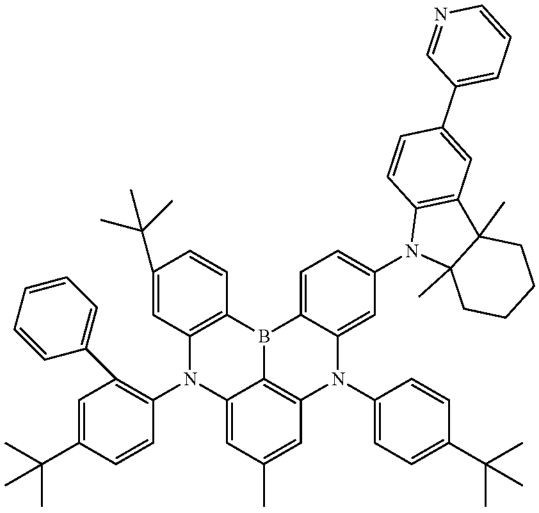
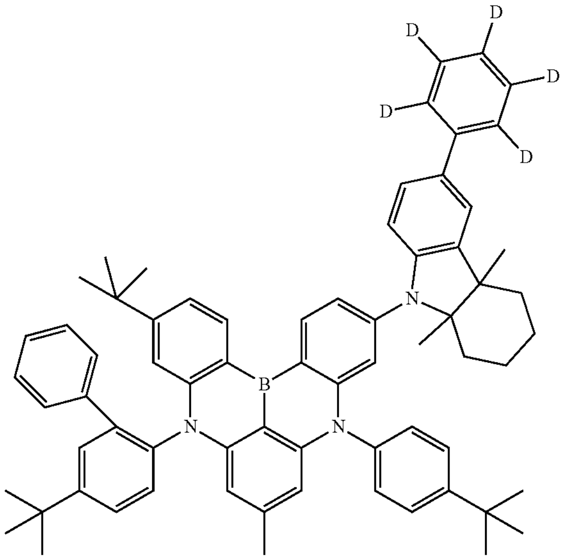
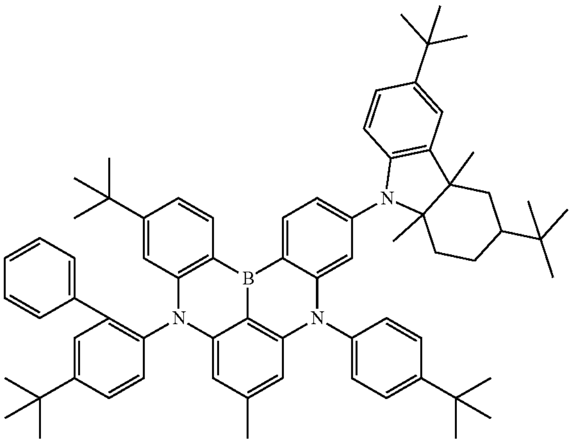

-continued
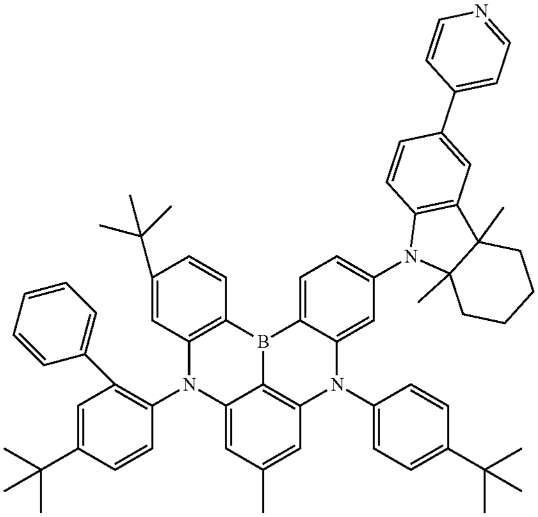
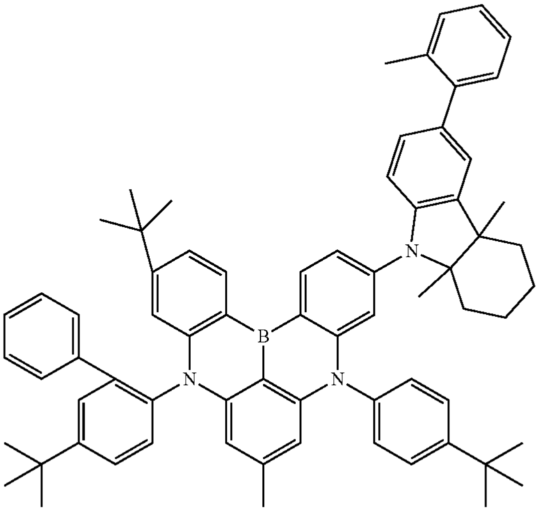
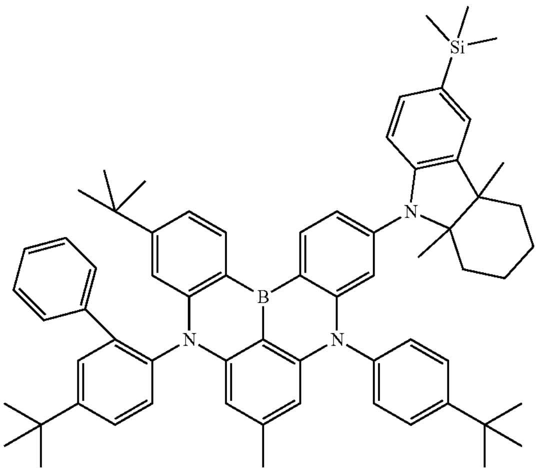
-continued
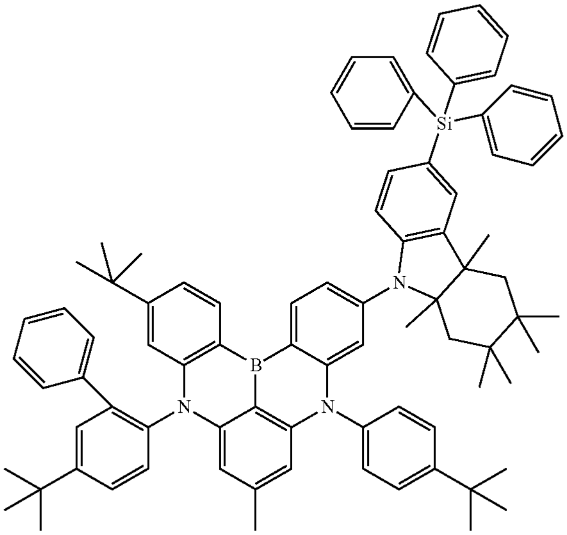
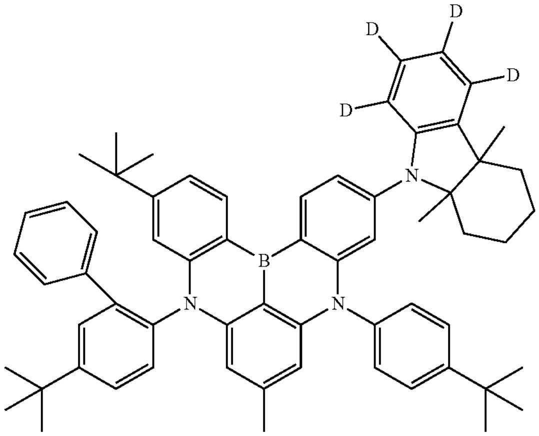
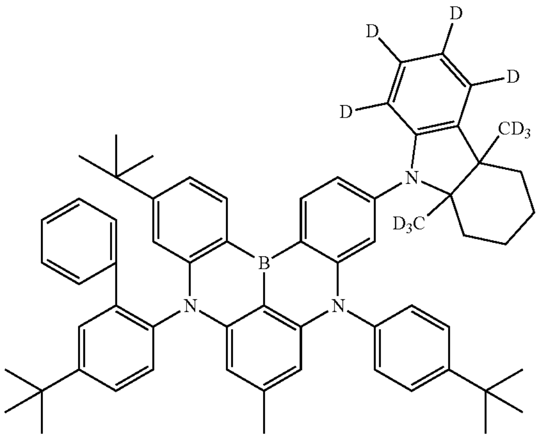

-continued
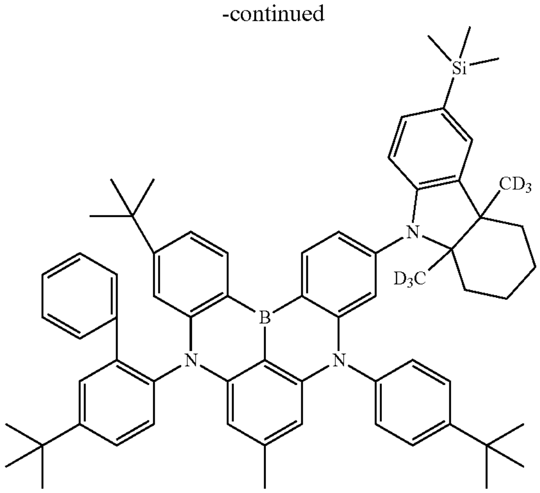
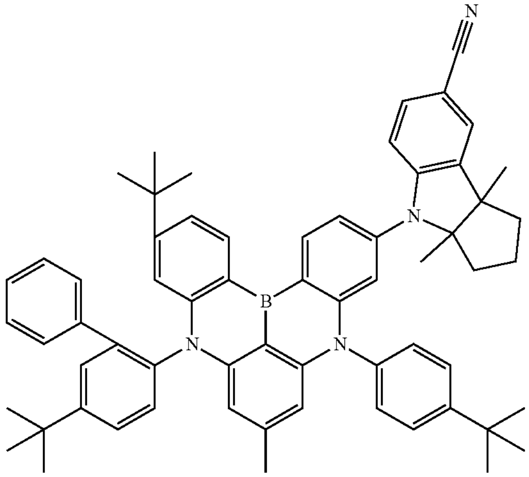
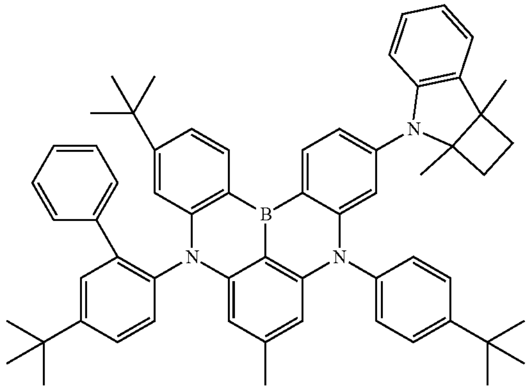
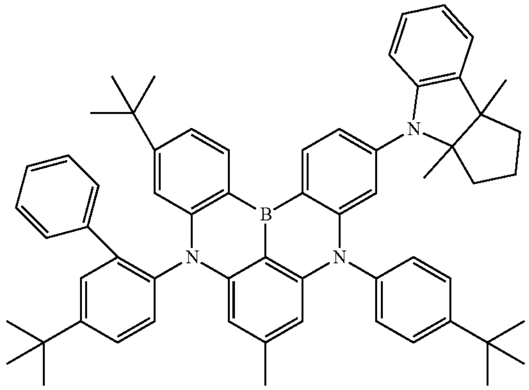
-continued
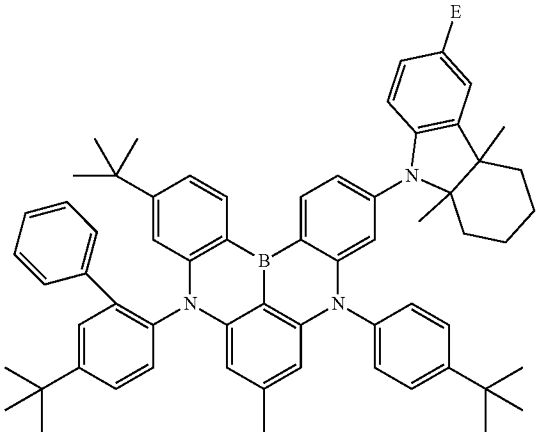
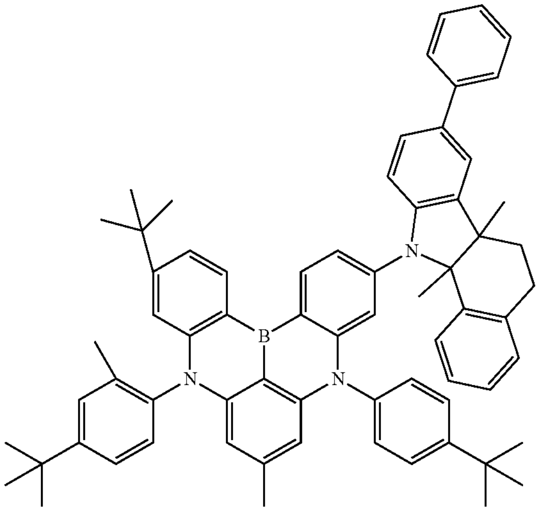
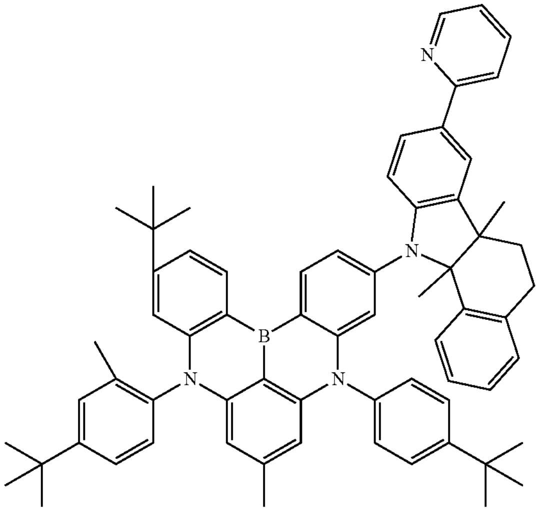

-continued
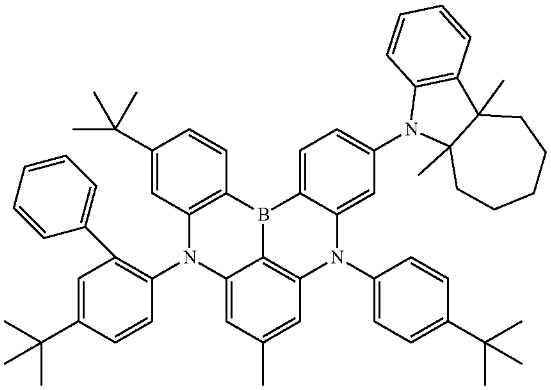
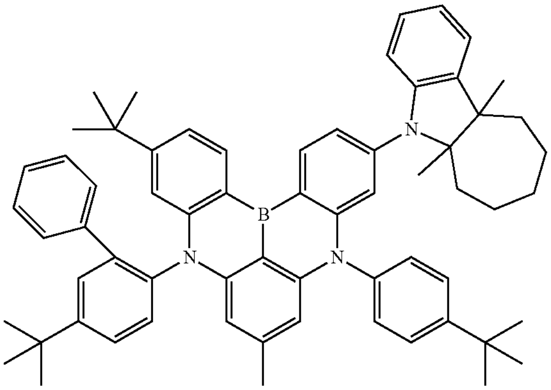
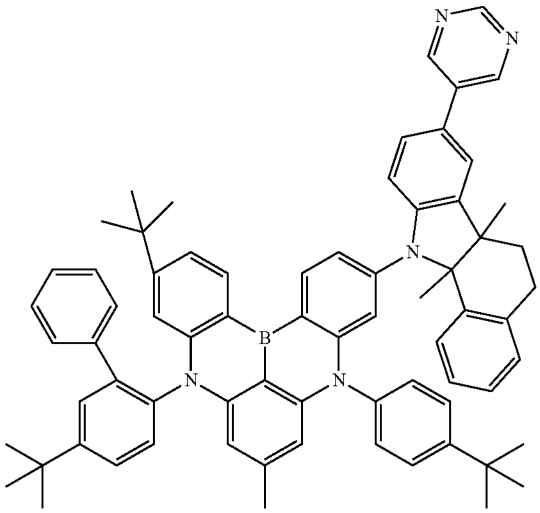
-continued
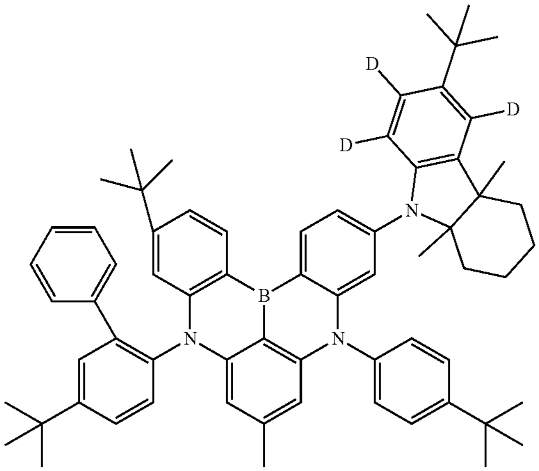
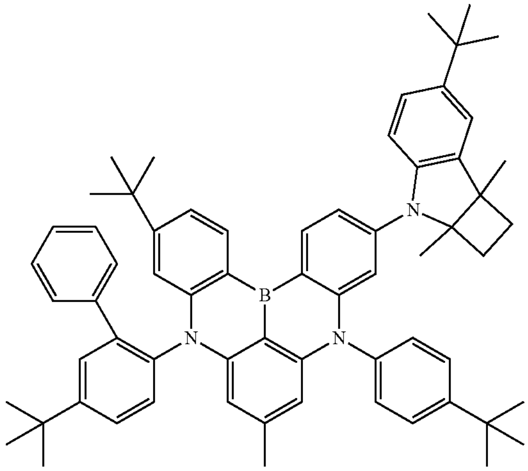
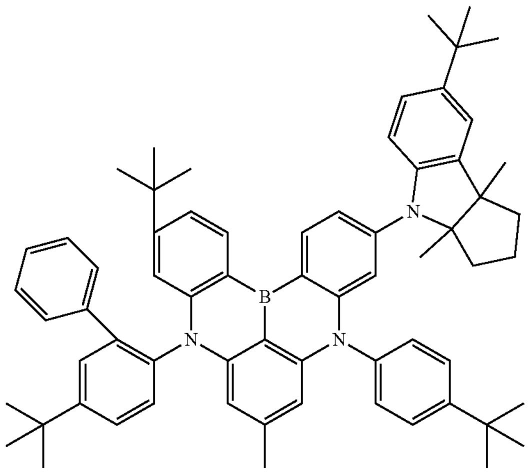

-continued
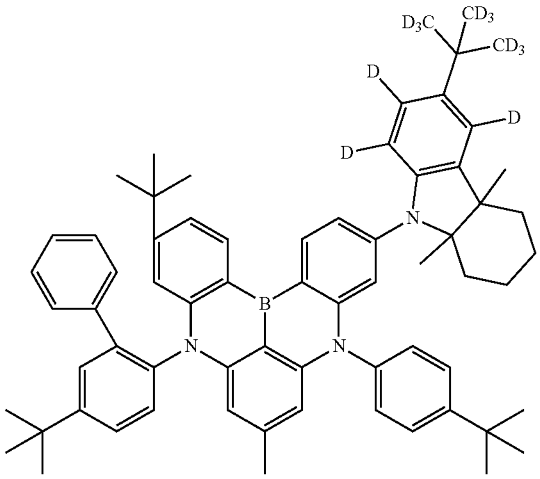
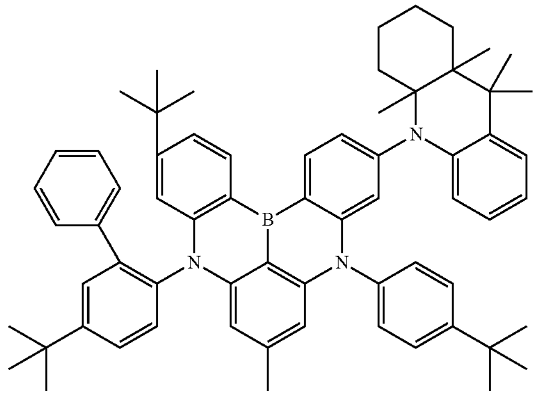
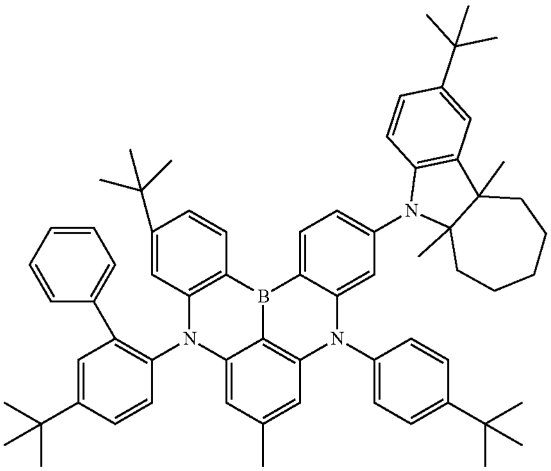
-continued
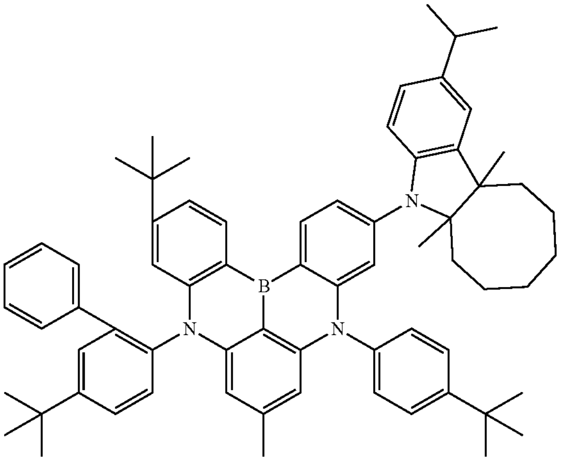
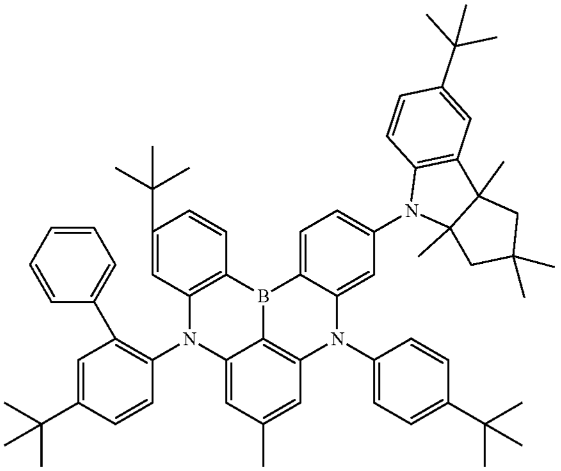
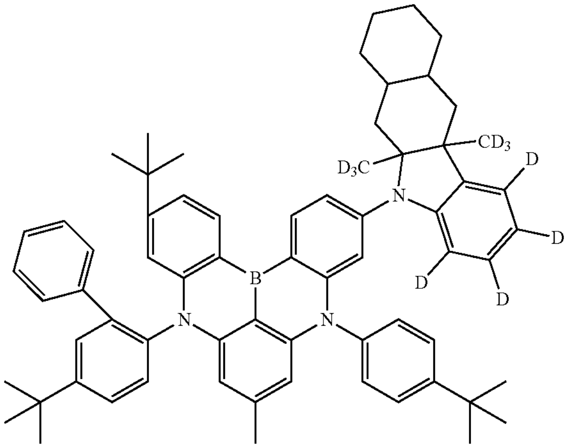

-continued
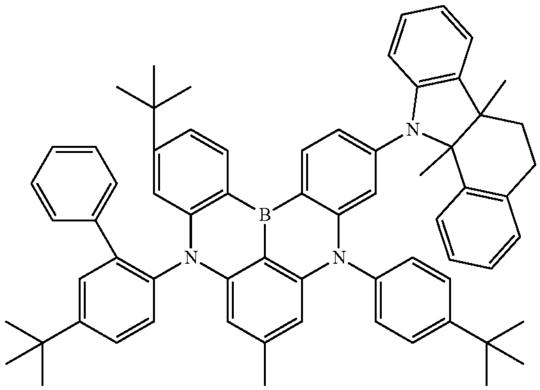
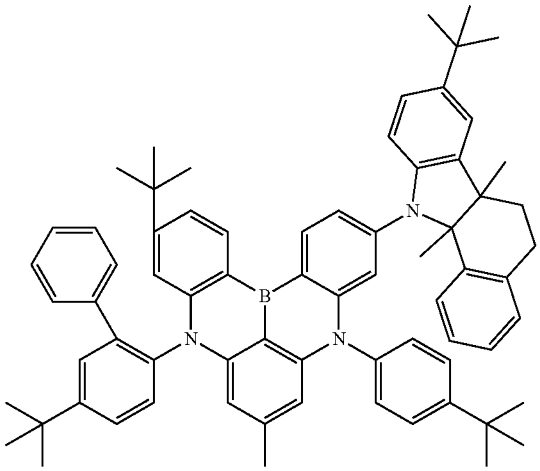
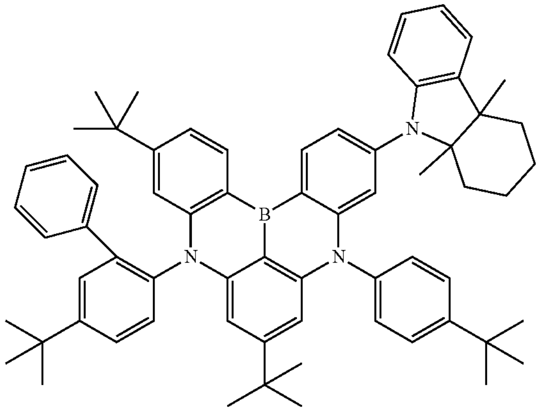
-continued
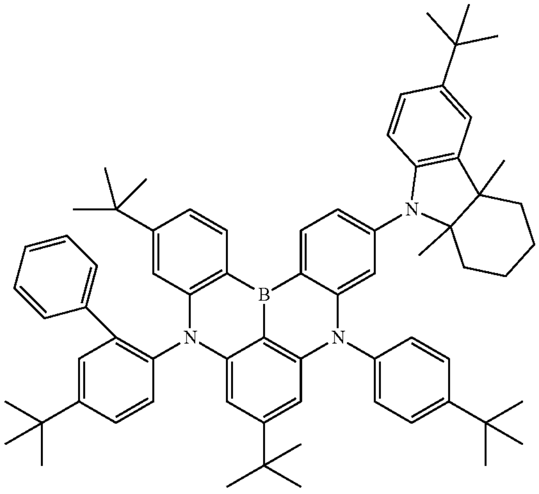
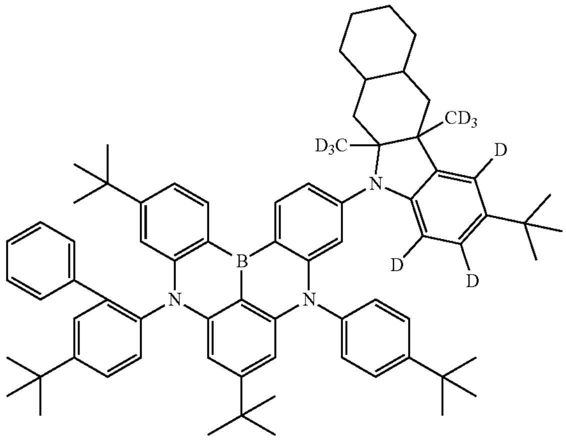
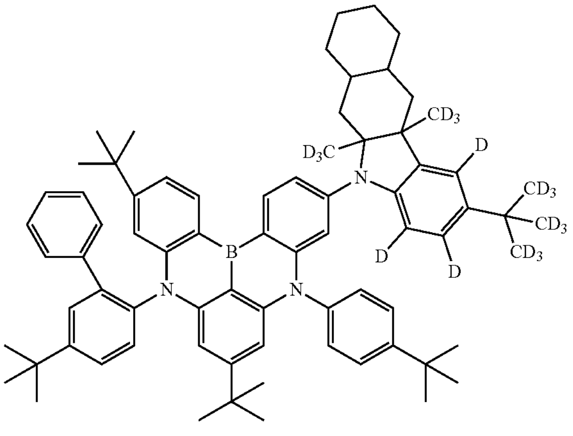

-continued
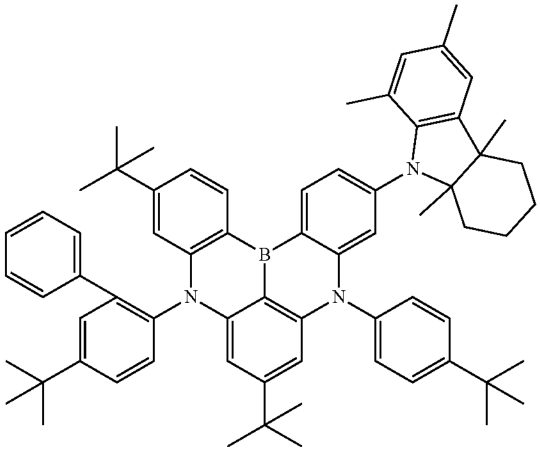
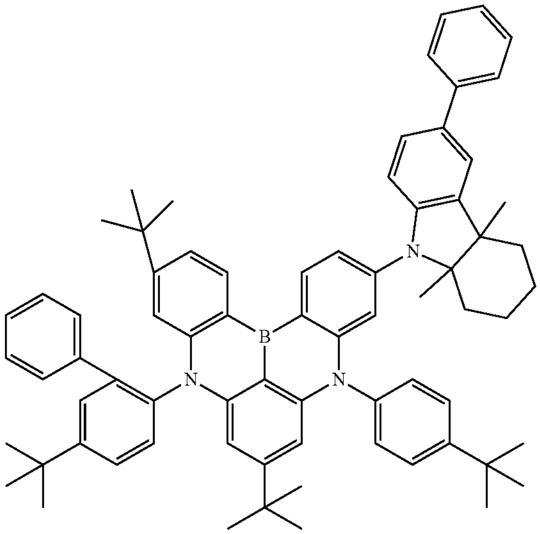
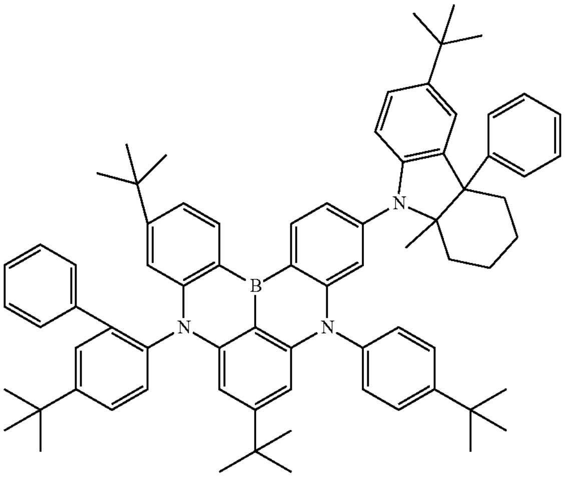
-continued
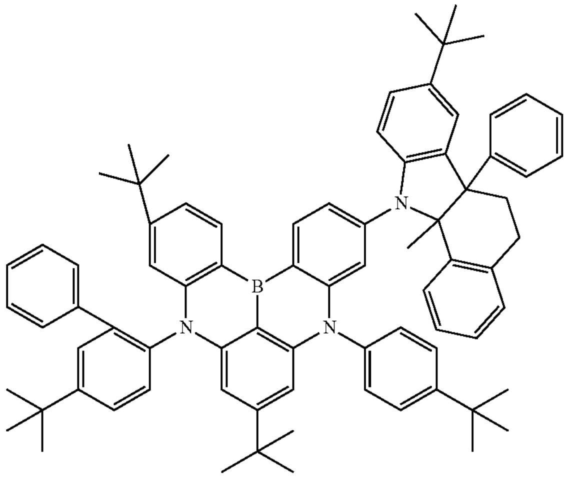
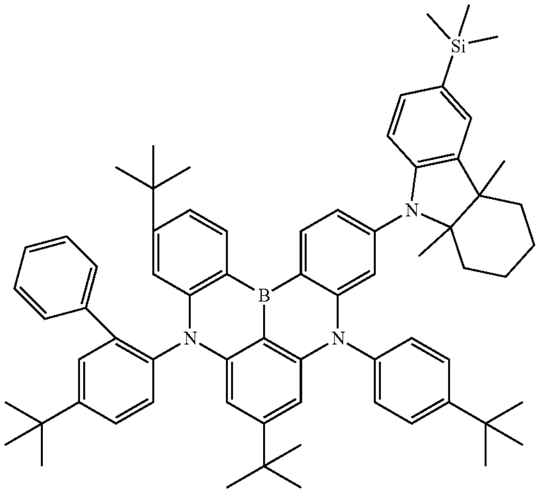
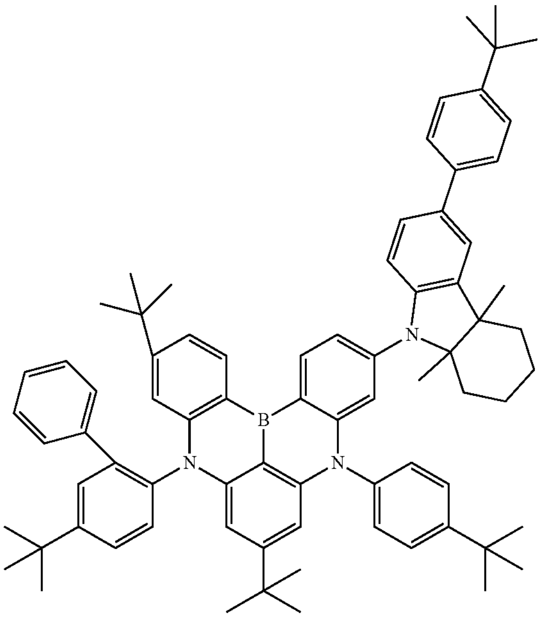

-continued
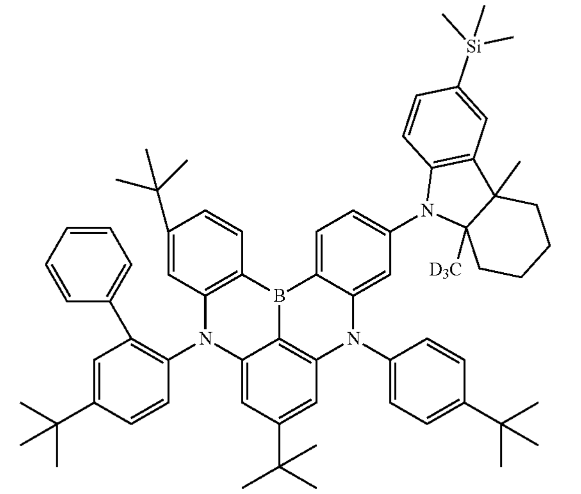
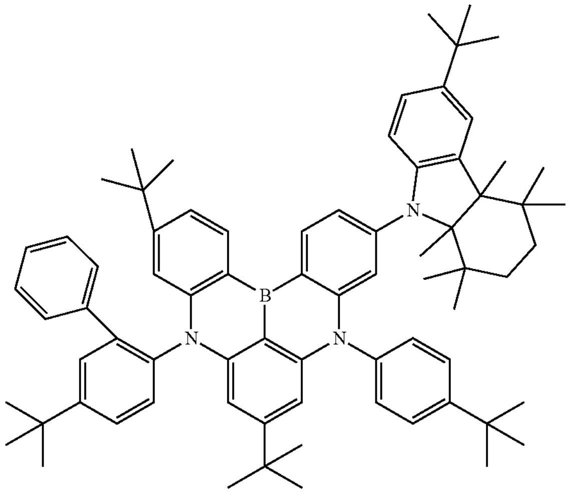
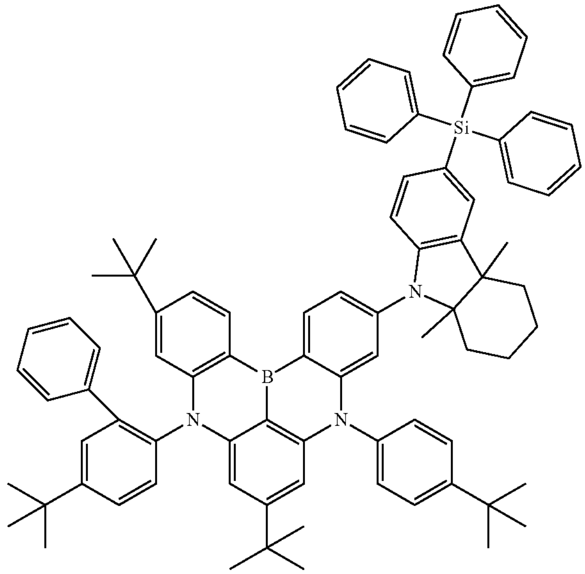
-continued
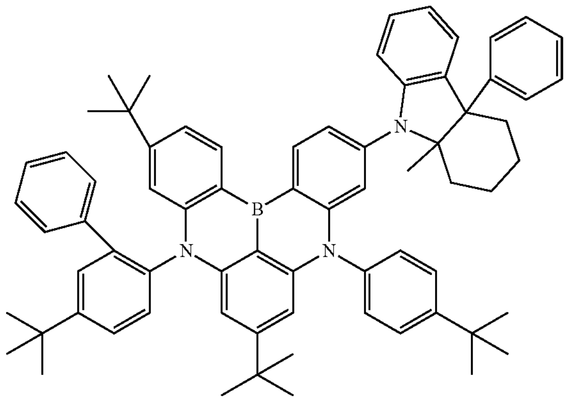
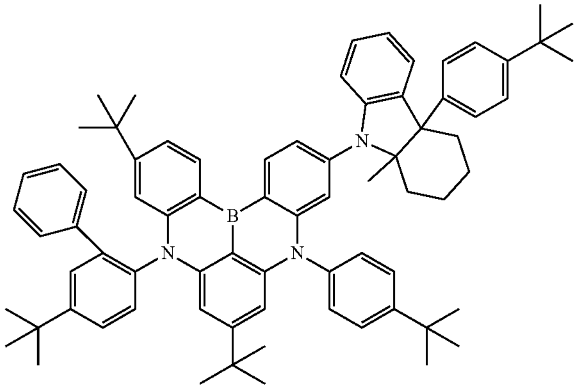
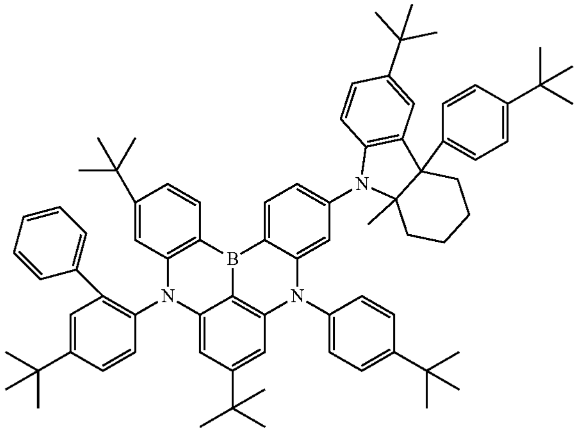

-continued
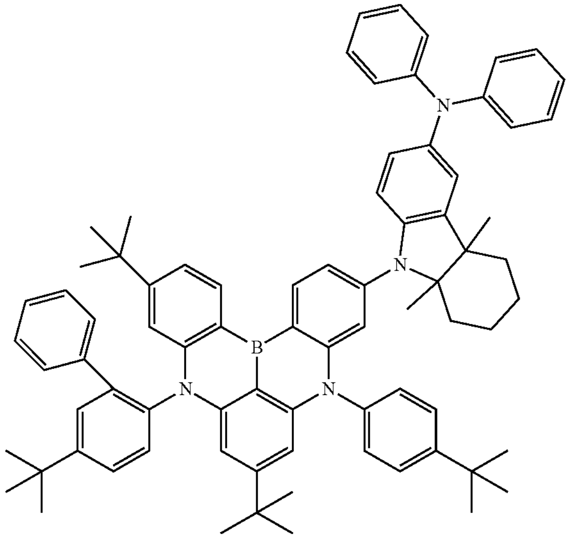
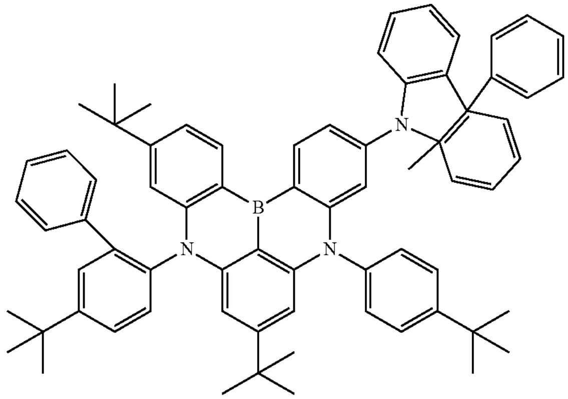
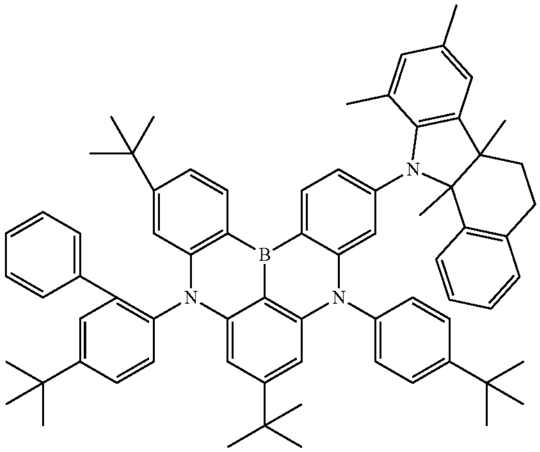
-continued
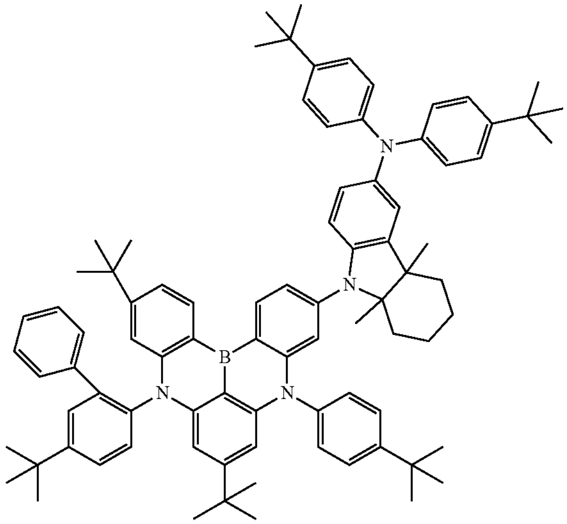
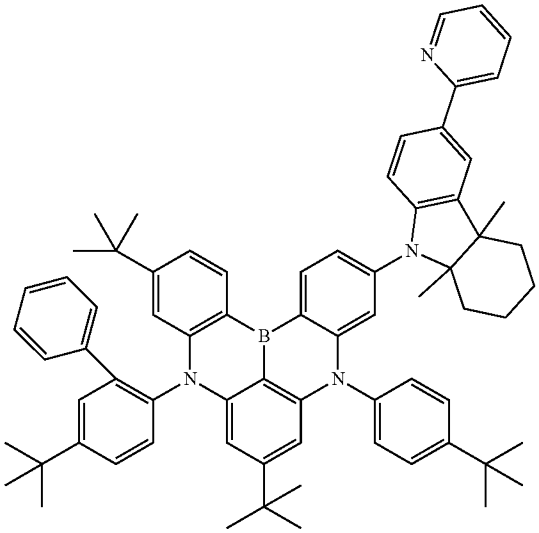
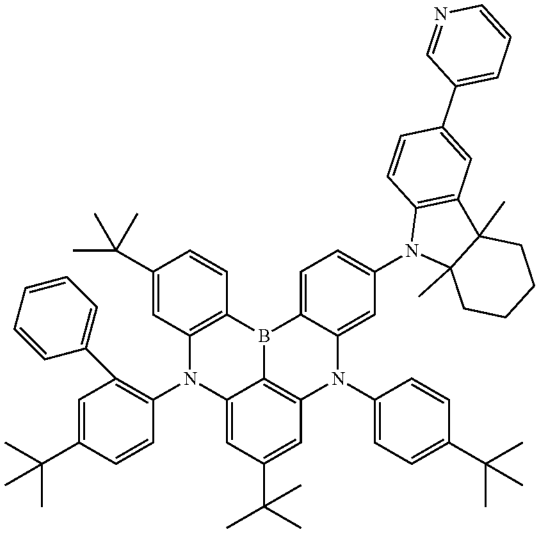

-continued
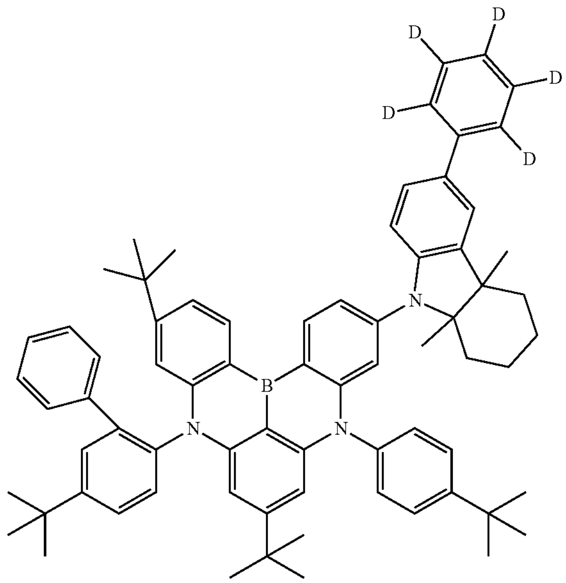
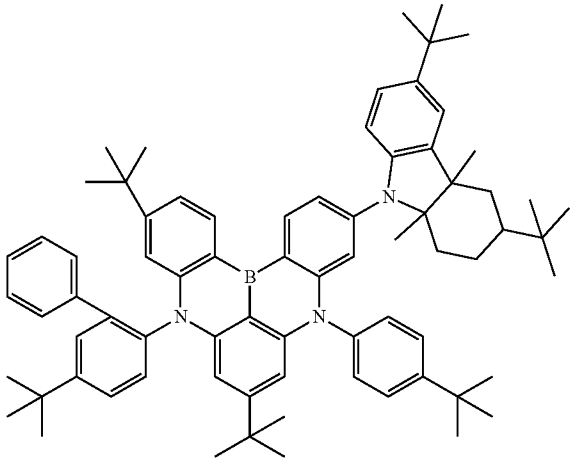
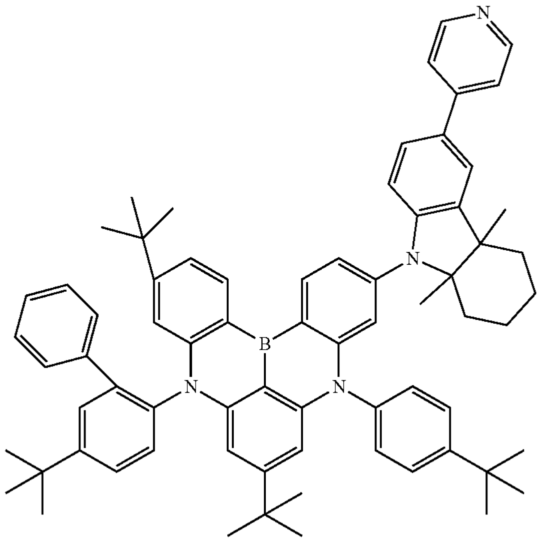
-continued
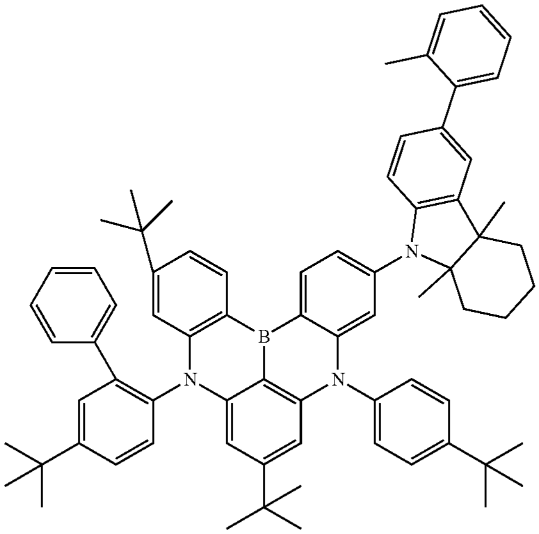
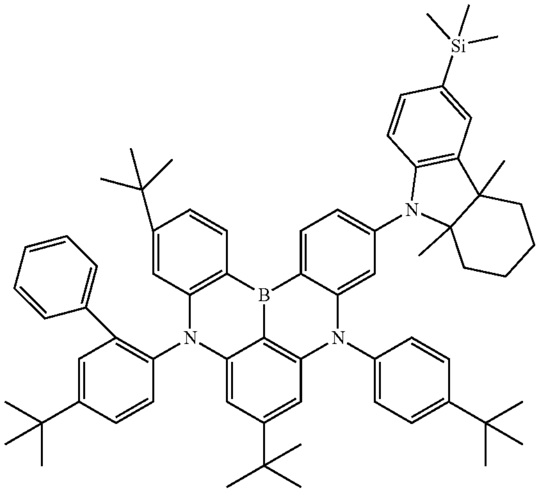
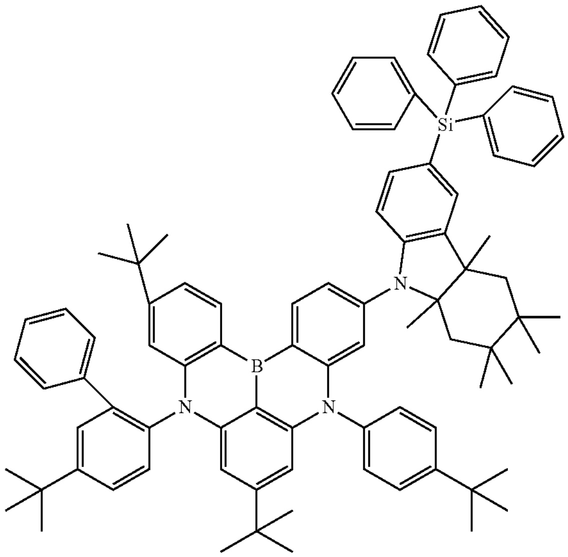

-continued
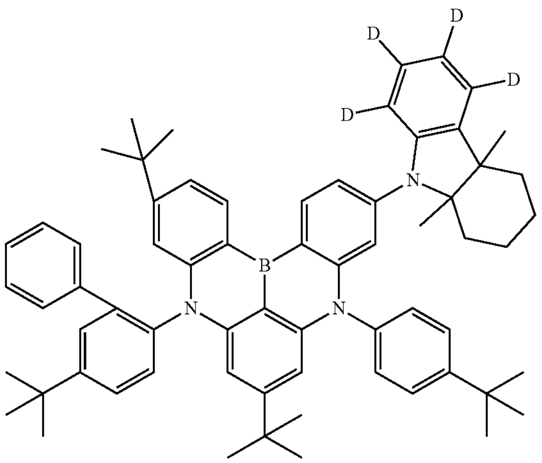
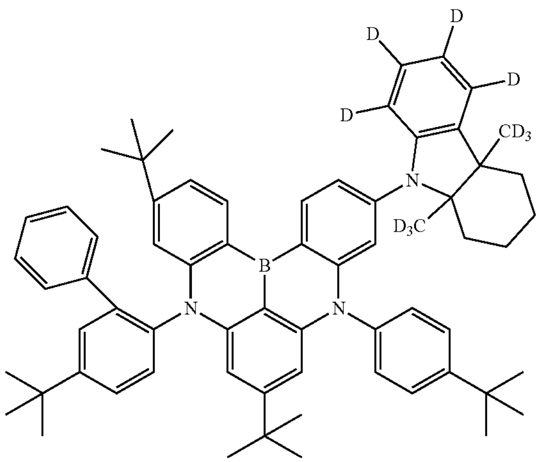
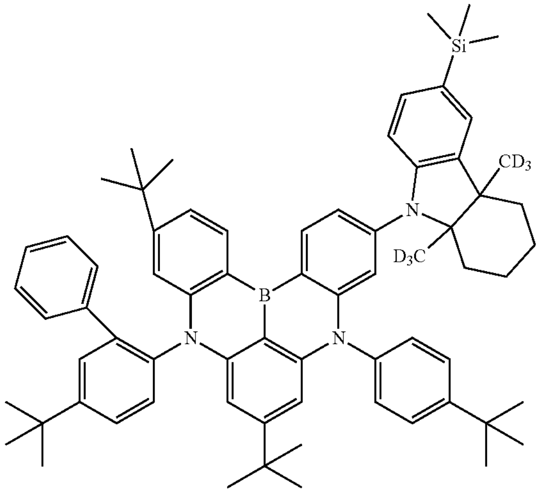
-continued
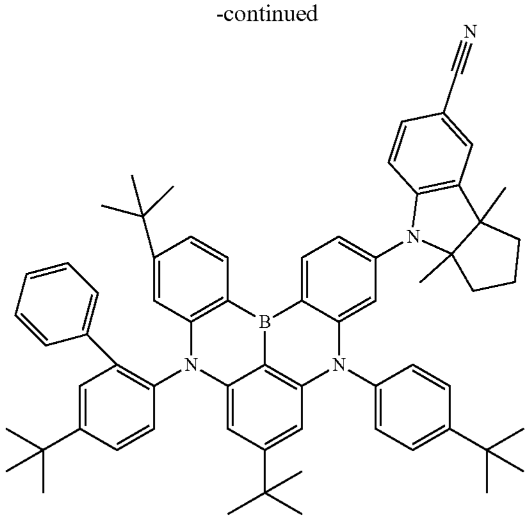
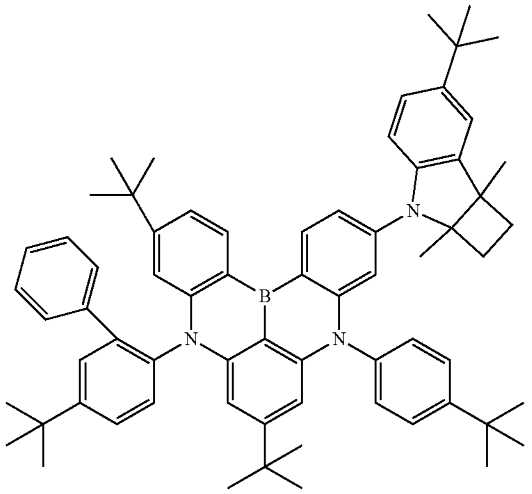
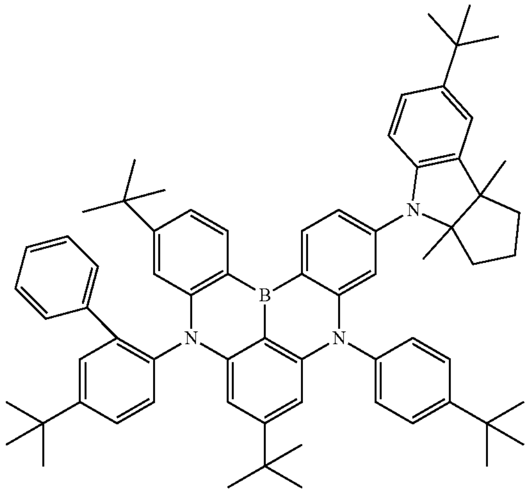

-continued
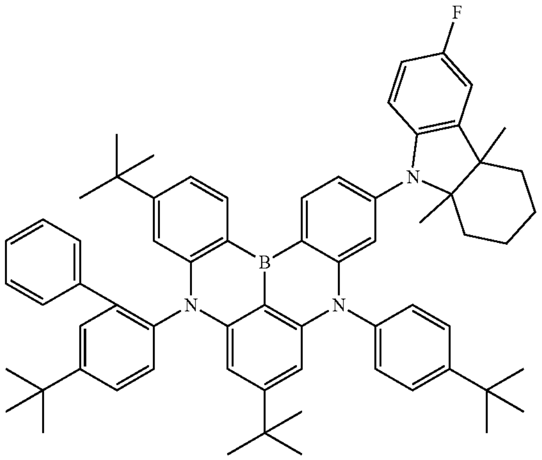
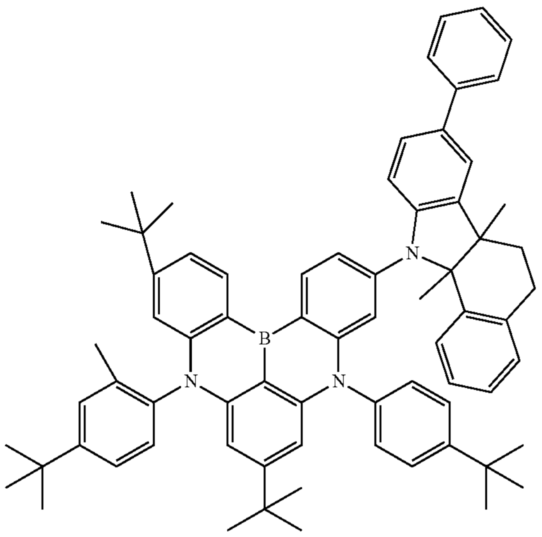
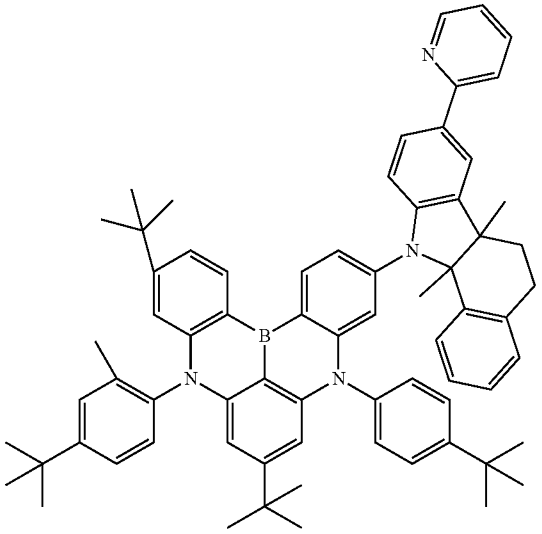
-continued
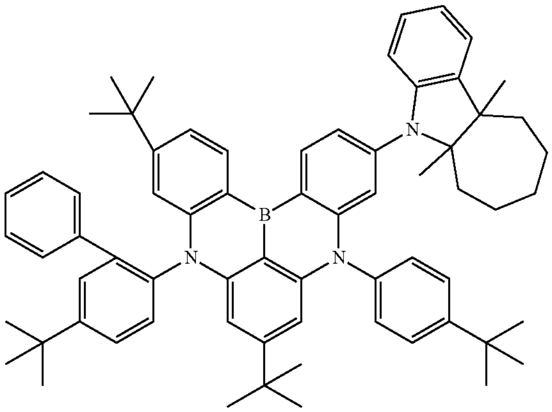
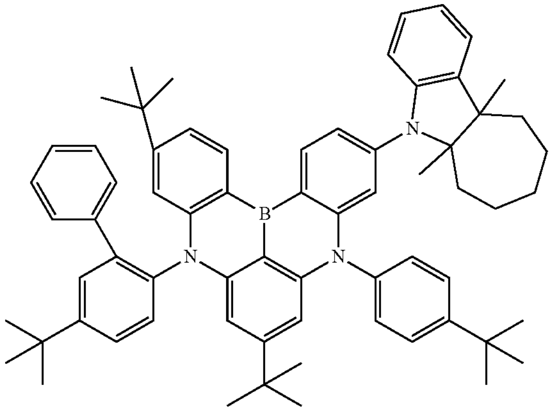
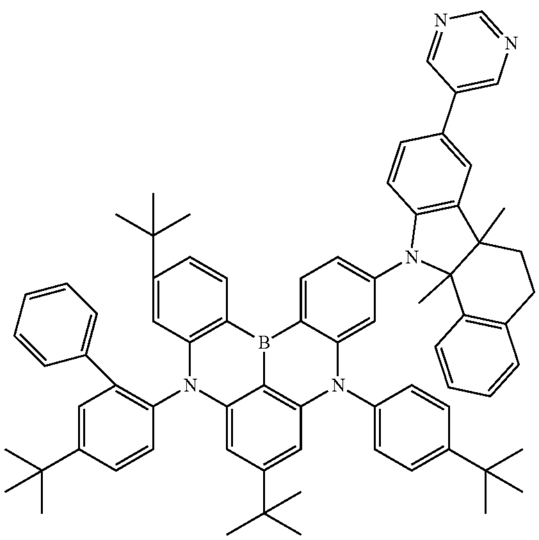

-continued
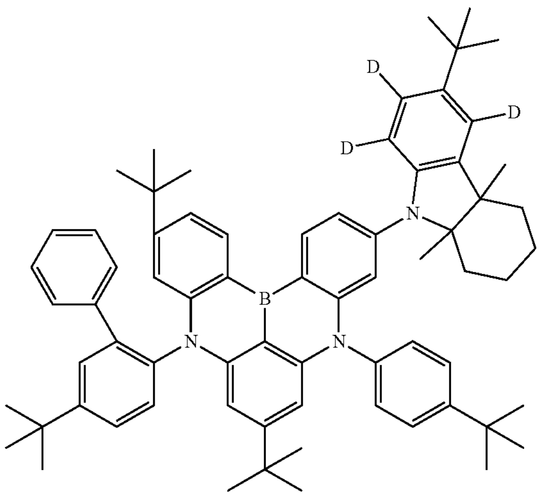
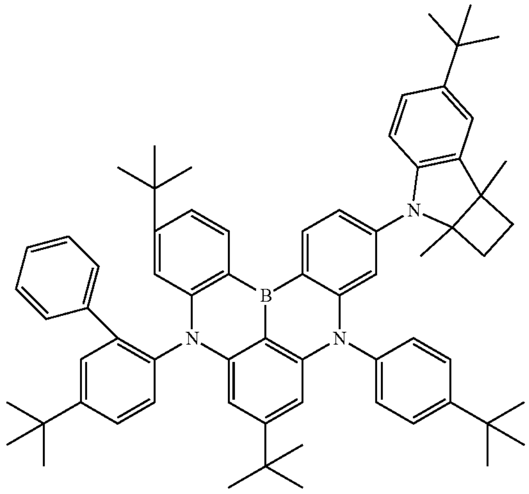
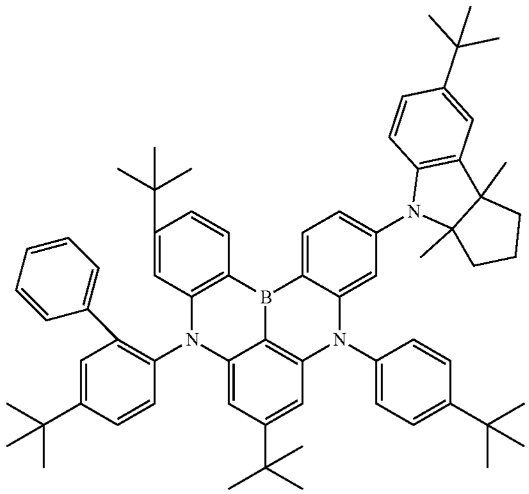
-continued
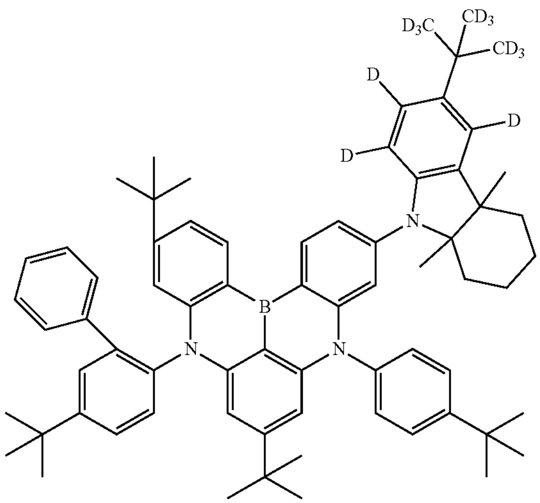
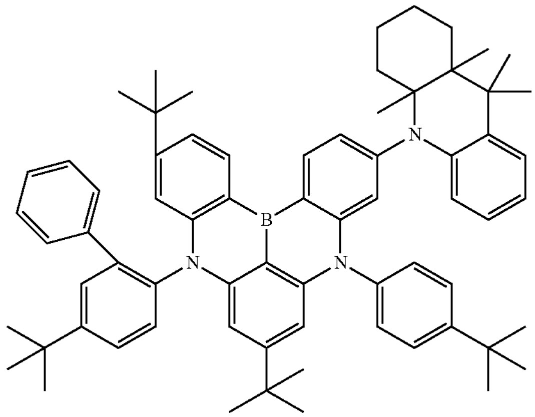
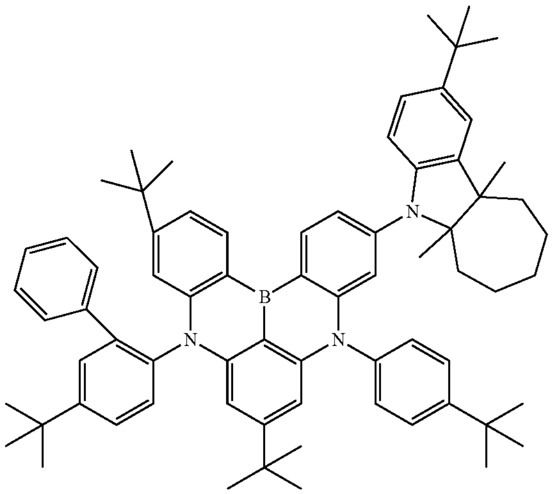

-continued
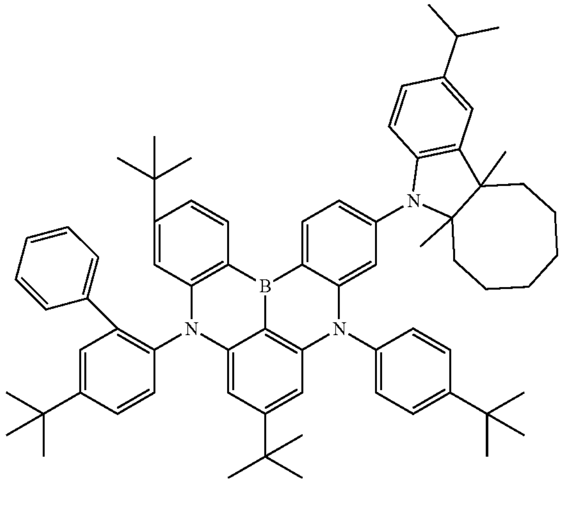
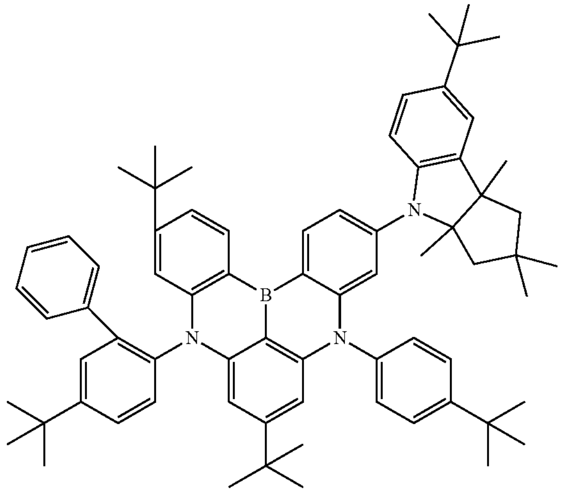
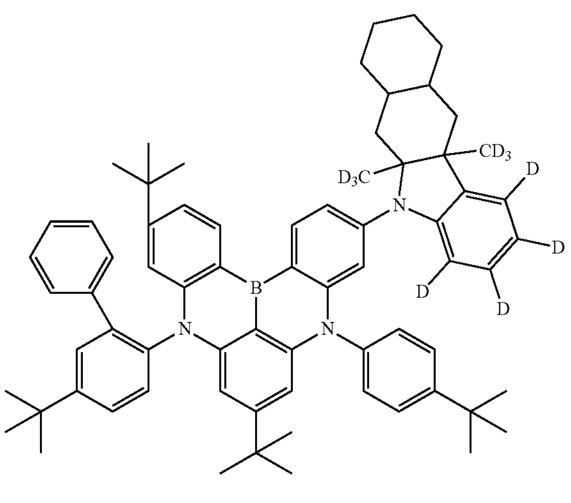
-continued
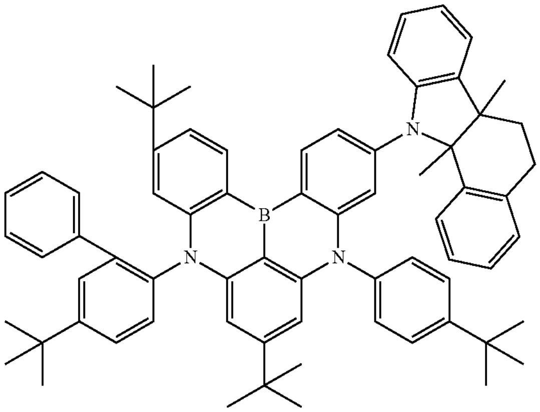
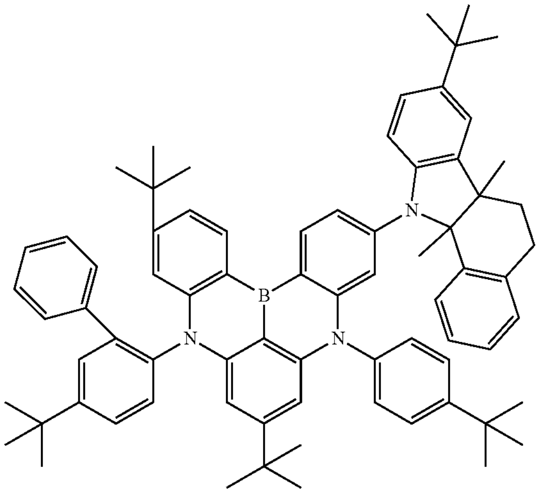
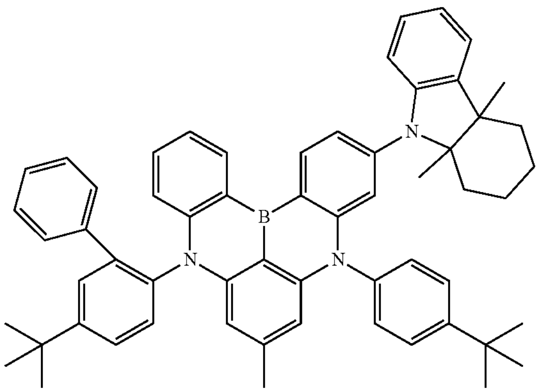

-continued
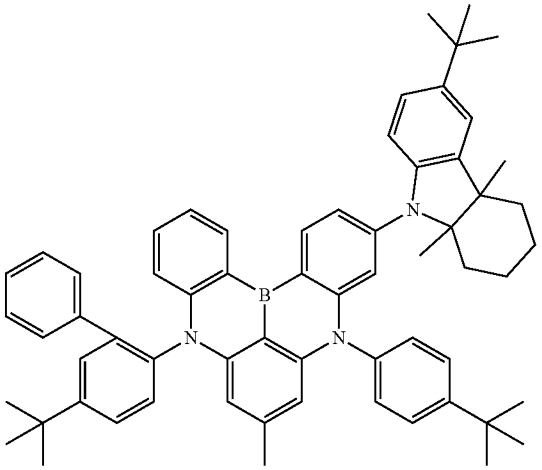
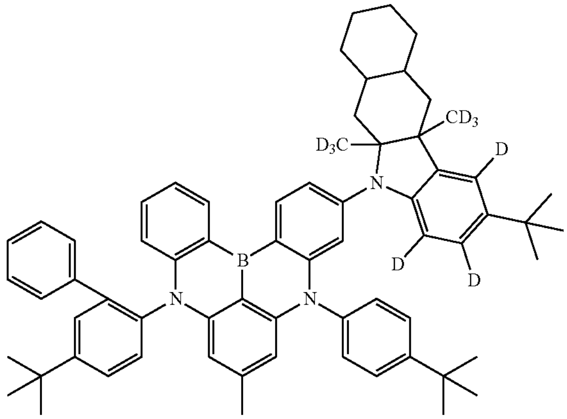
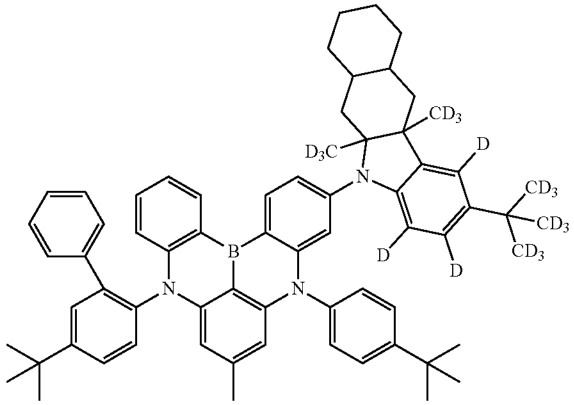
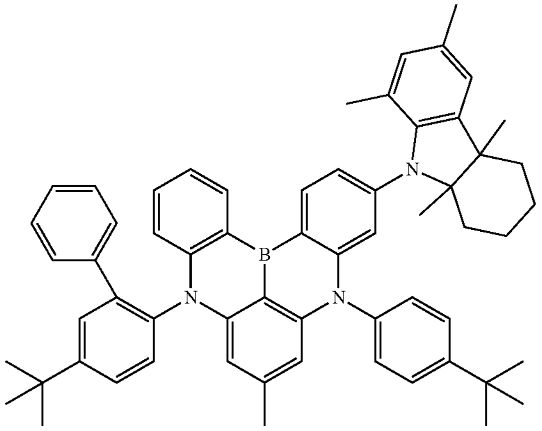
-continued
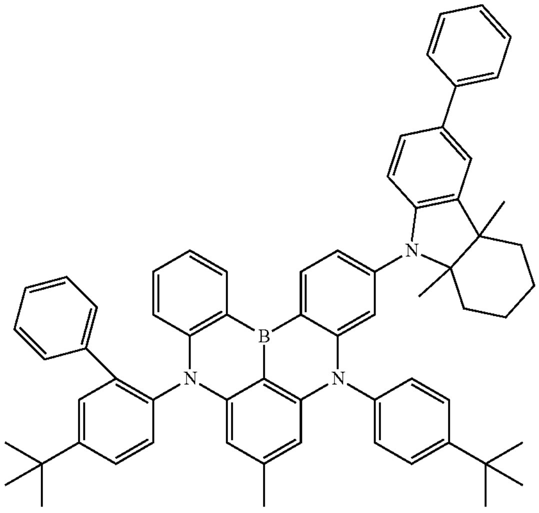
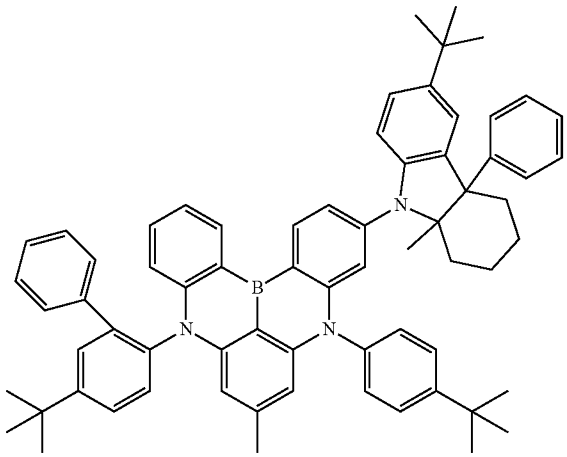
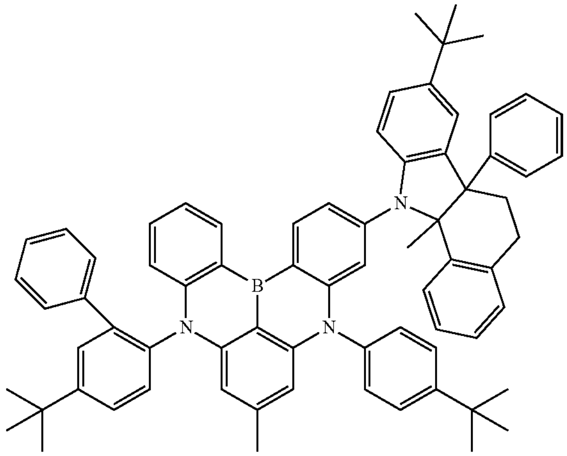

-continued
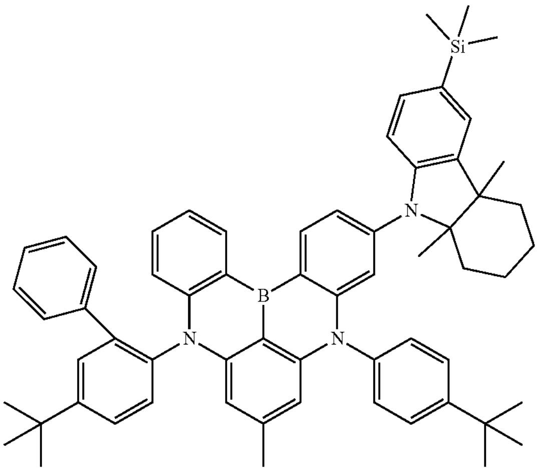
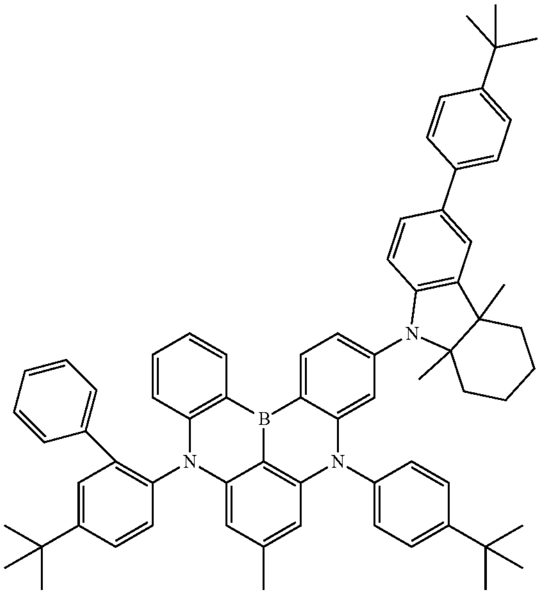
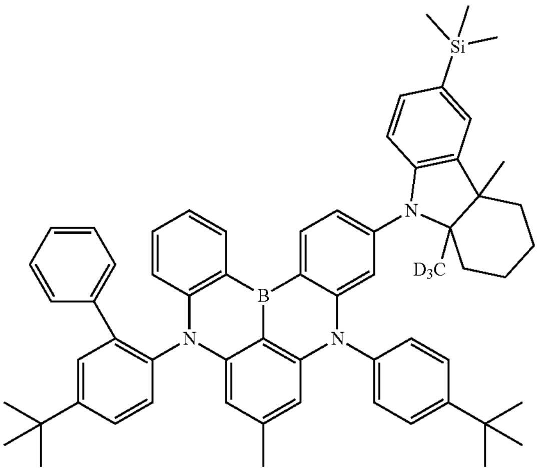
-continued
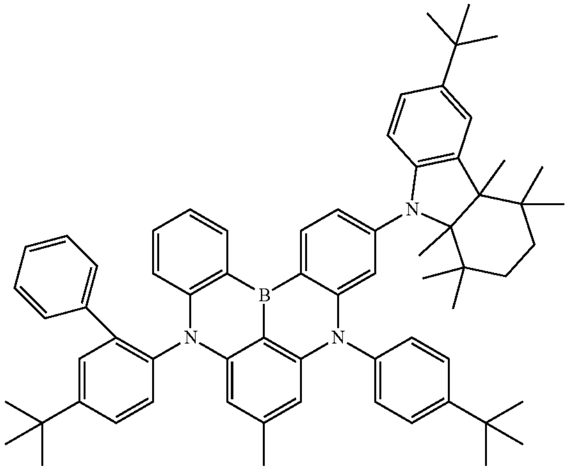
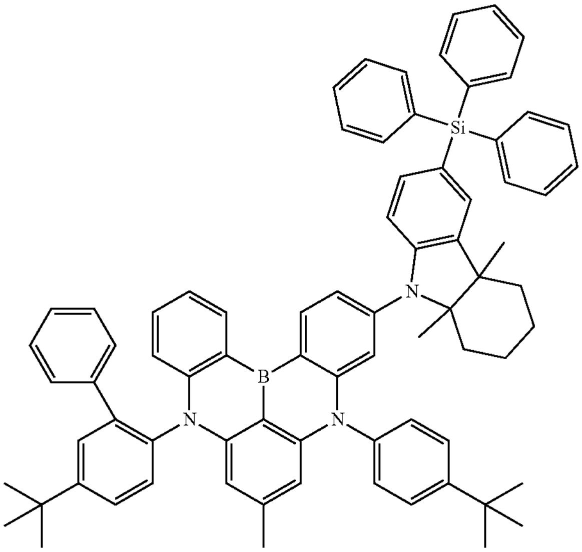
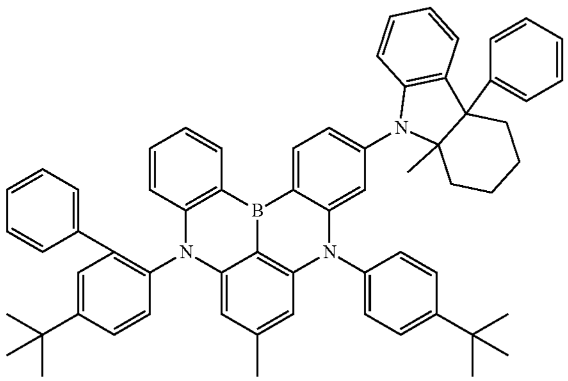

-continued
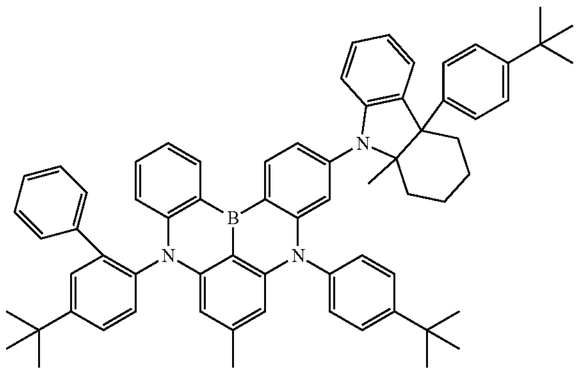
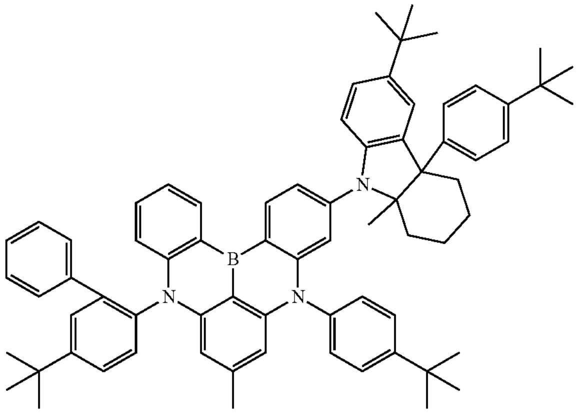
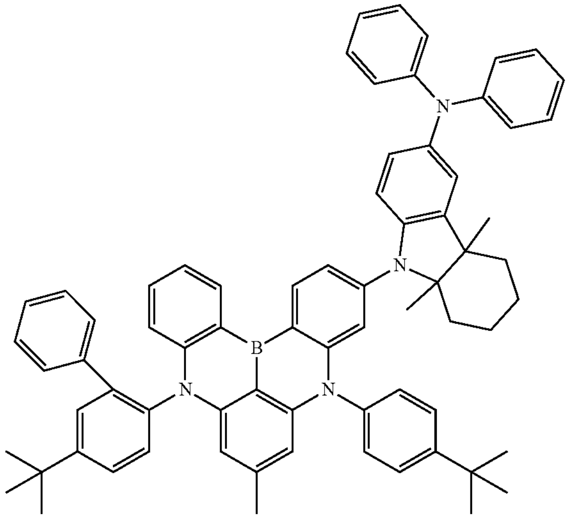
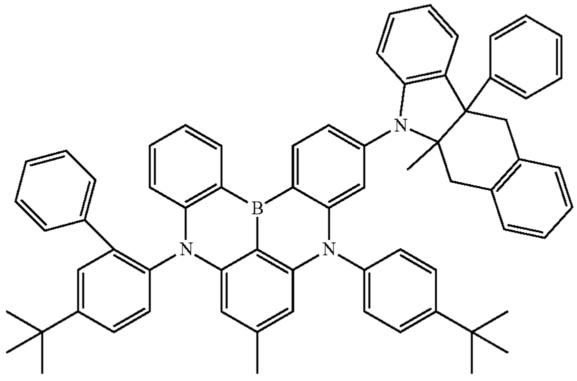
-continued
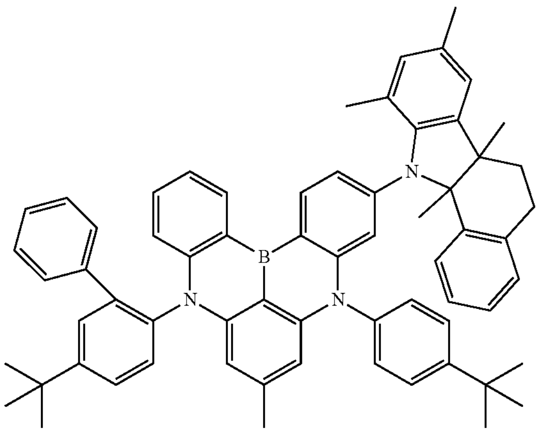
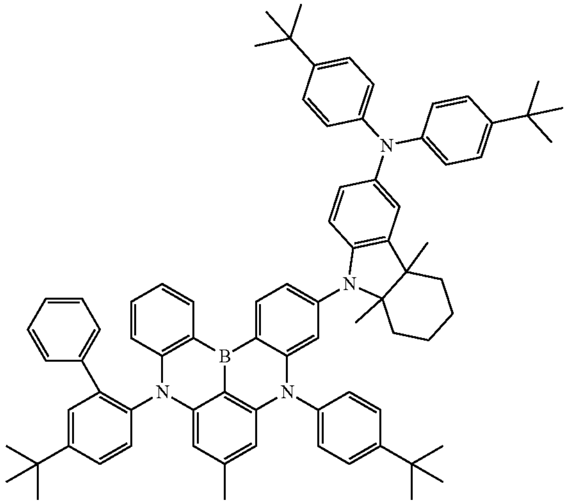
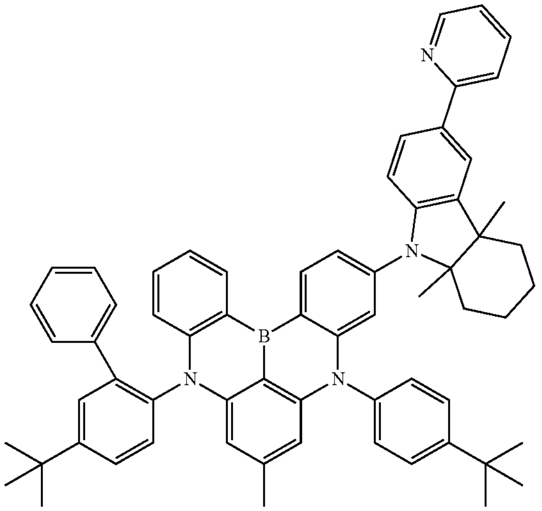

-continued
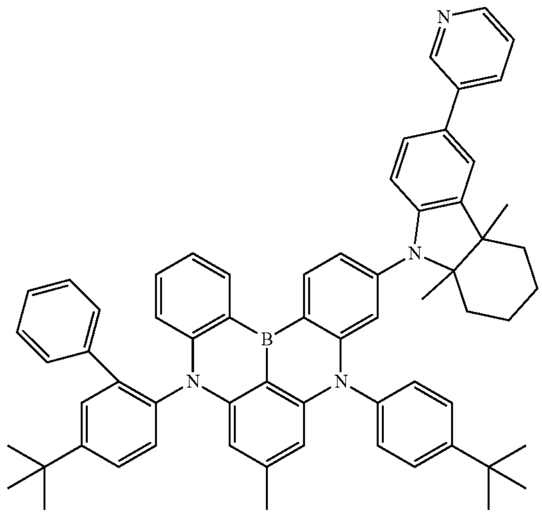
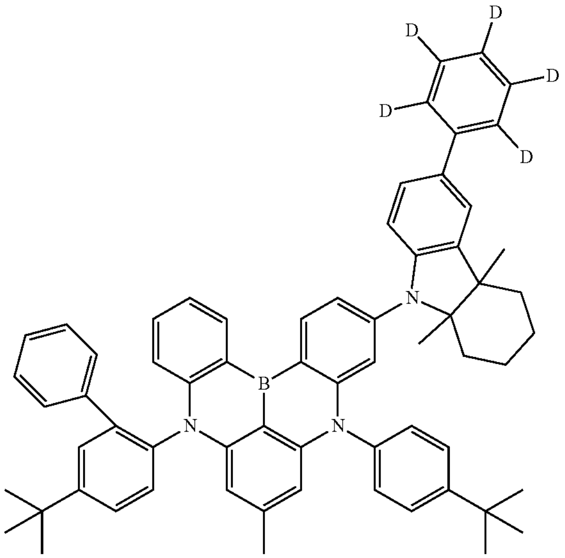
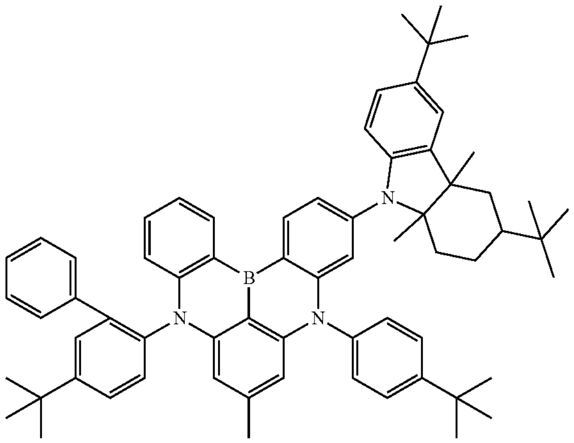
-continued
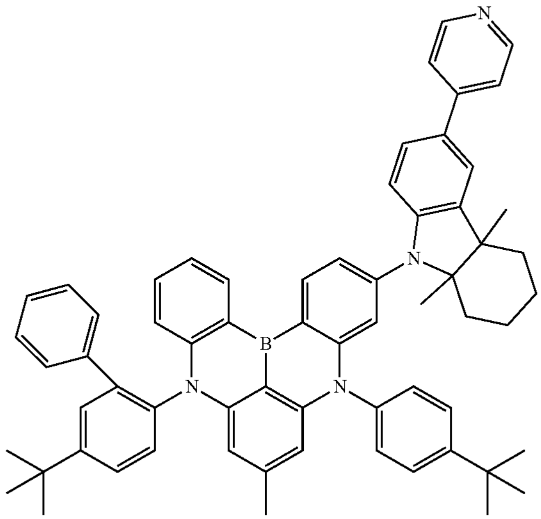
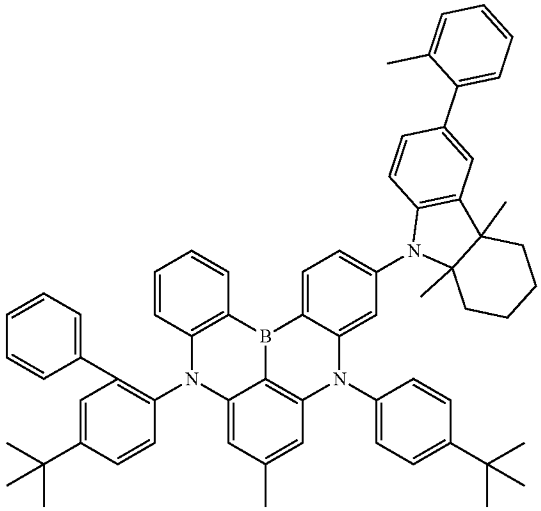
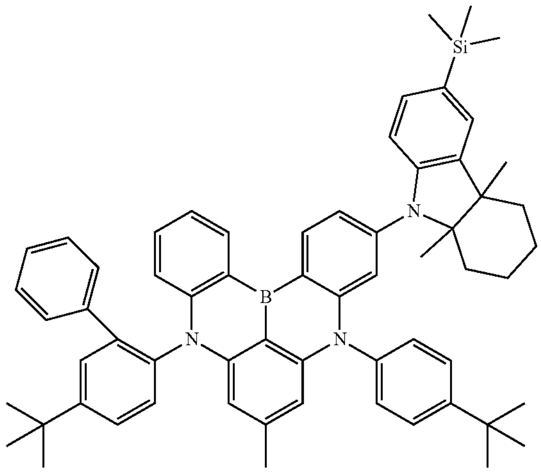

-continued
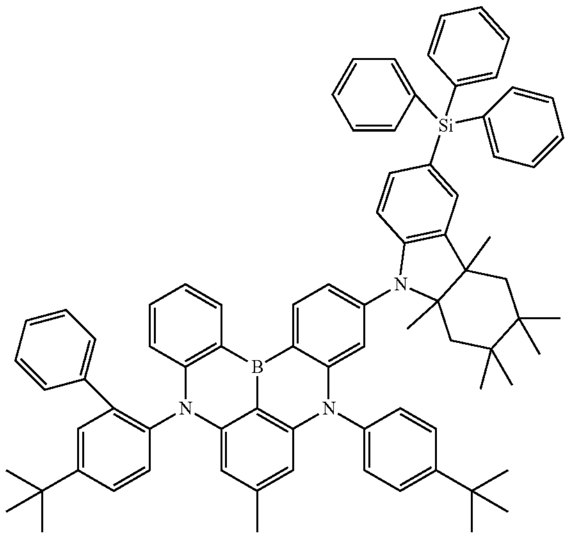
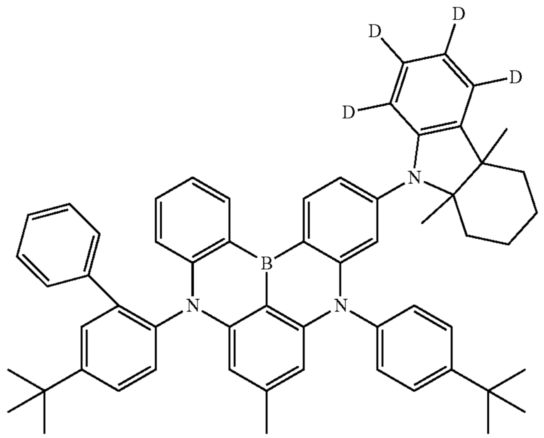
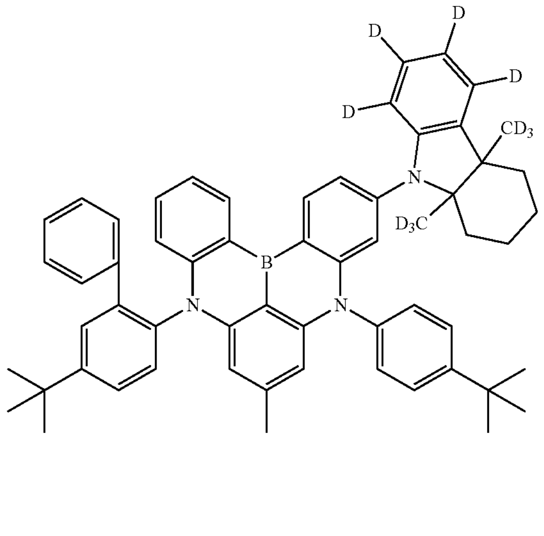
-continued
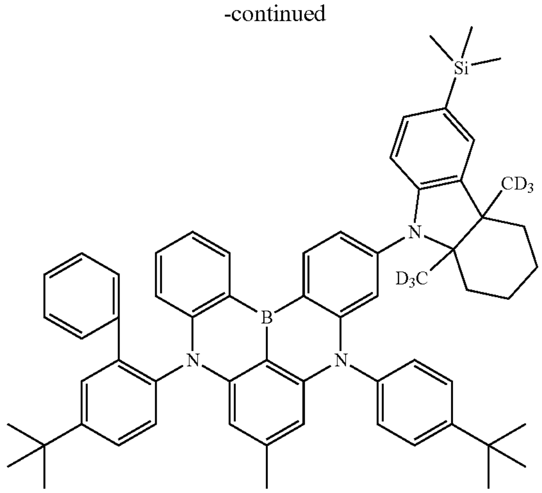
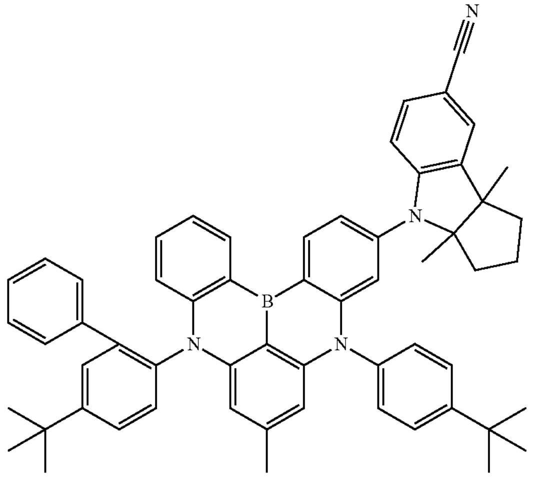
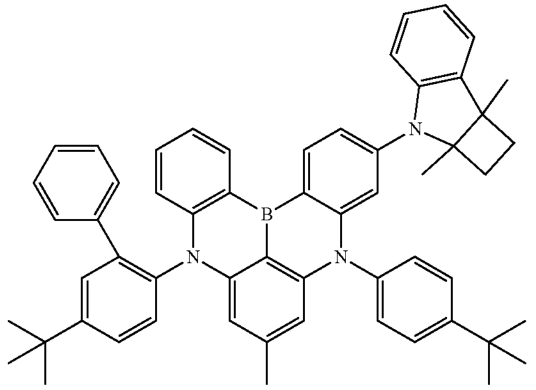
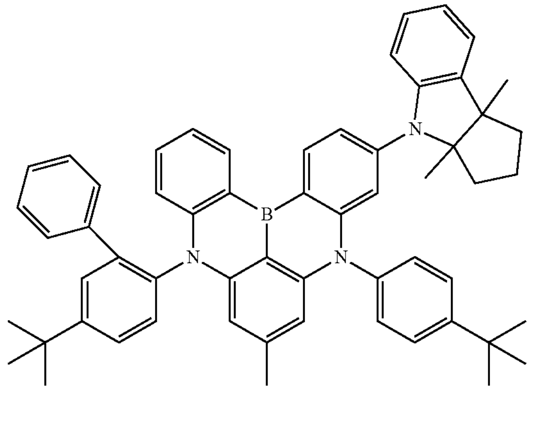

-continued
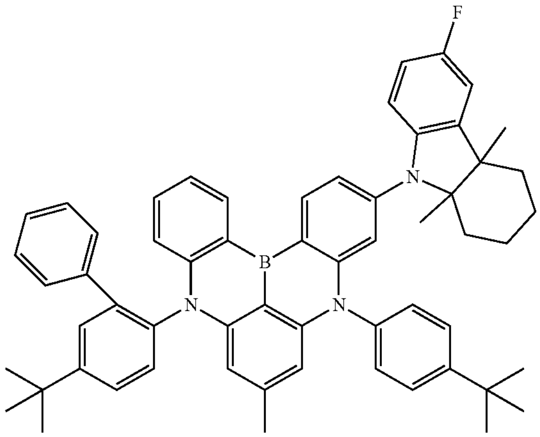
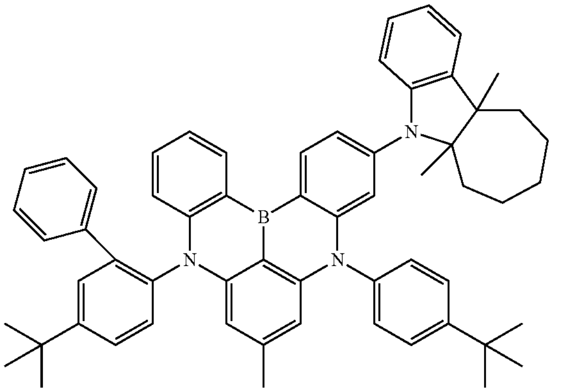
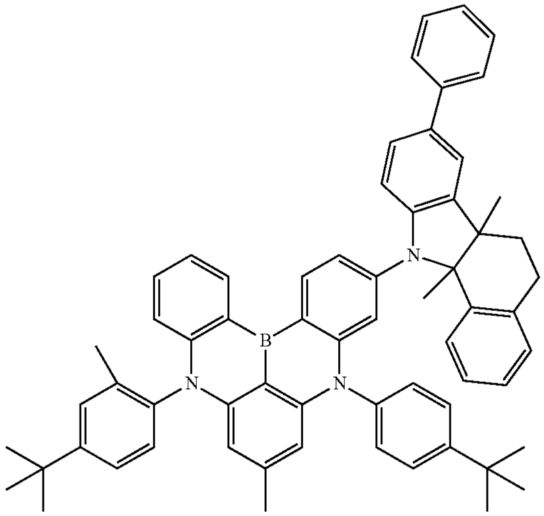
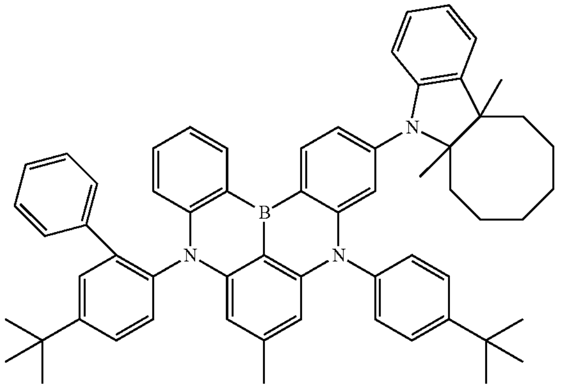
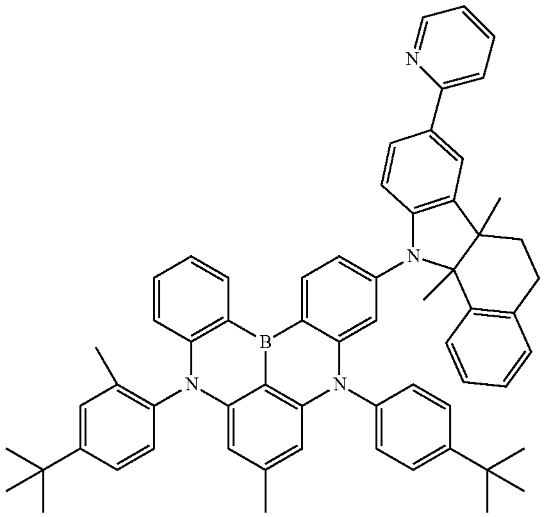
-continued
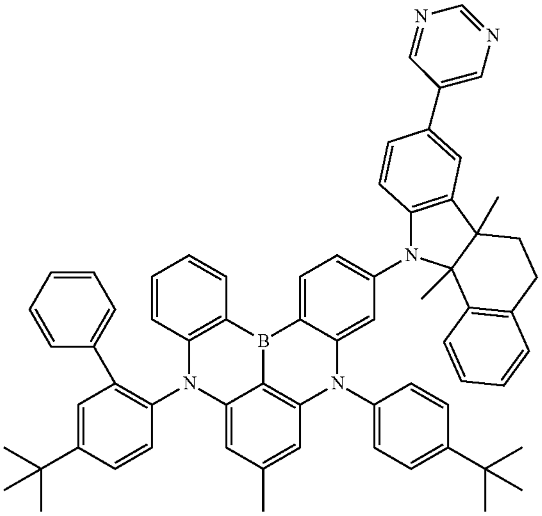

-continued
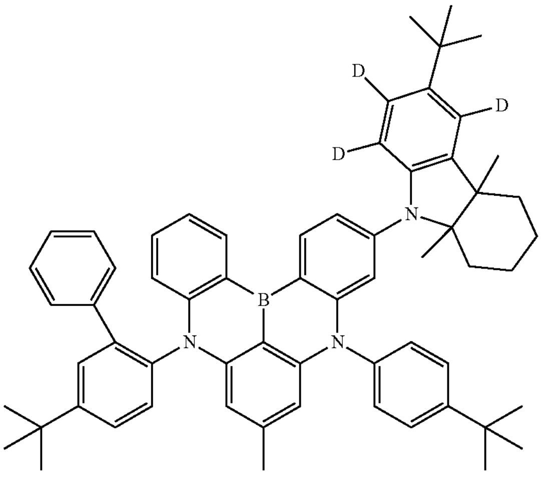
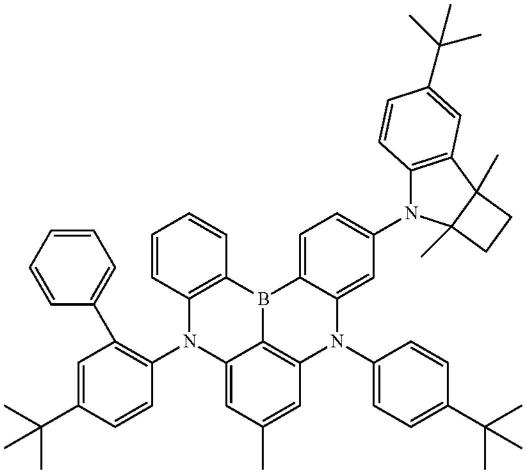
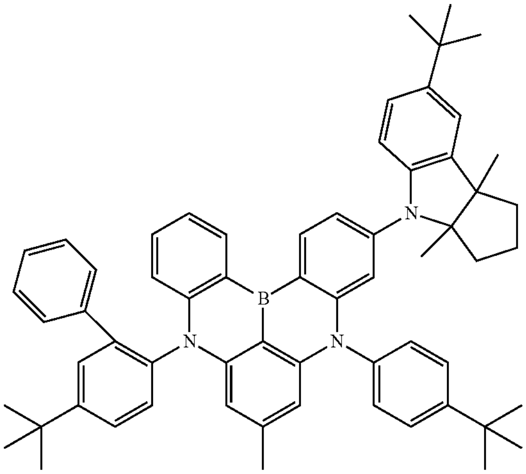
-continued
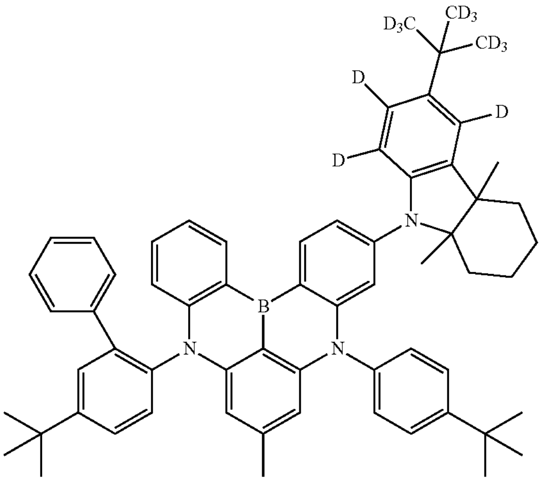
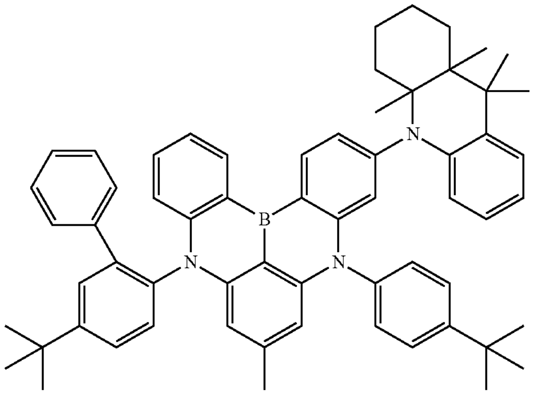
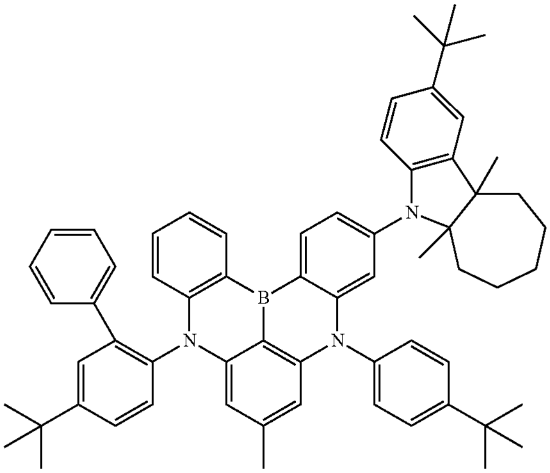

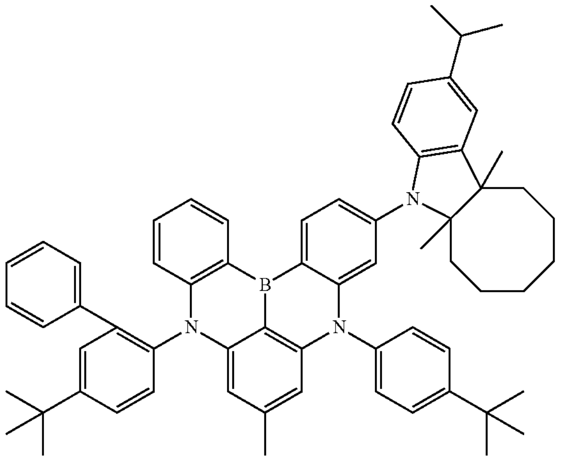
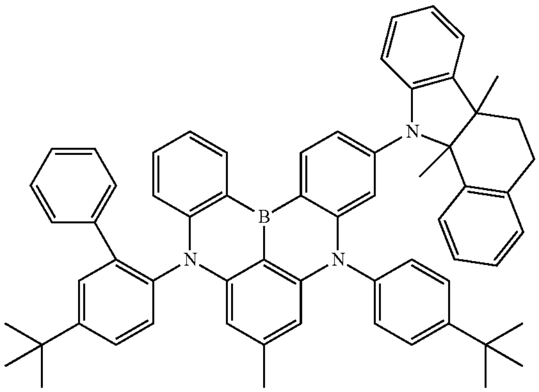
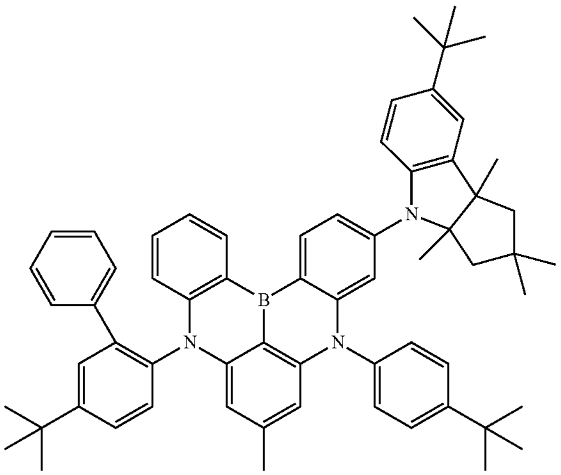
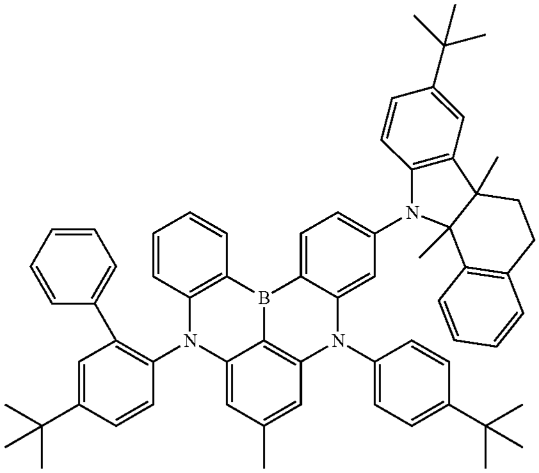
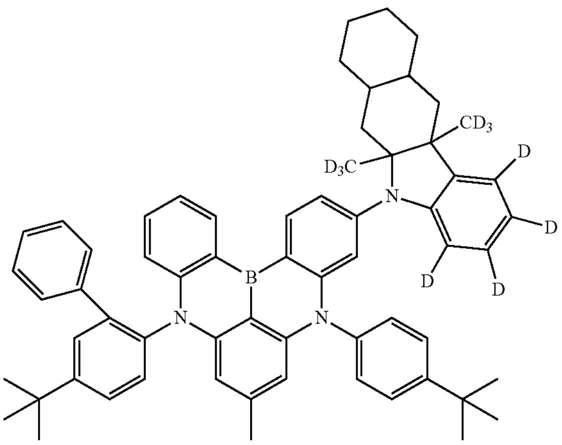
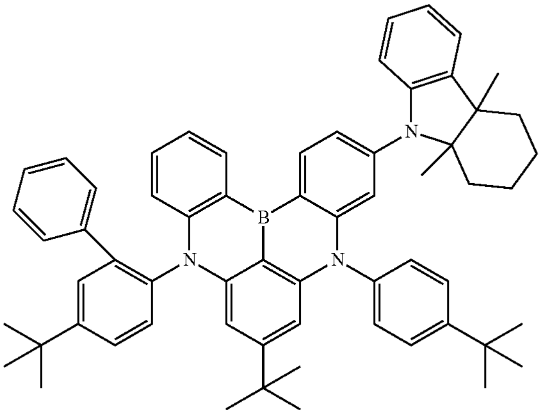

-continued
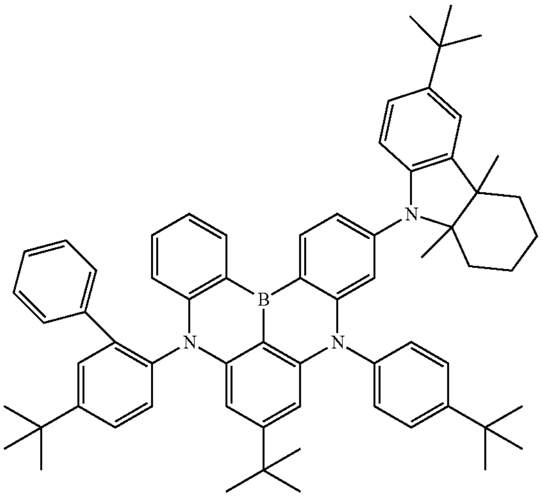
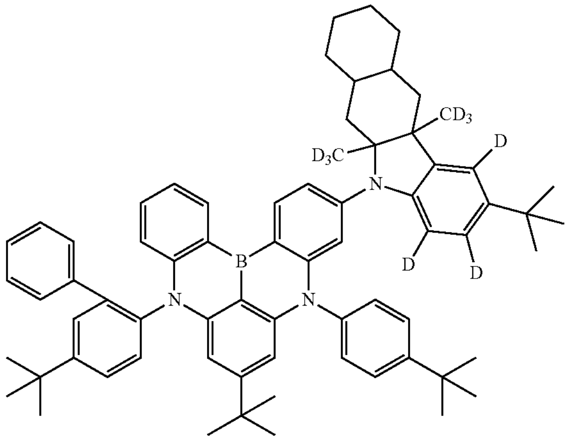
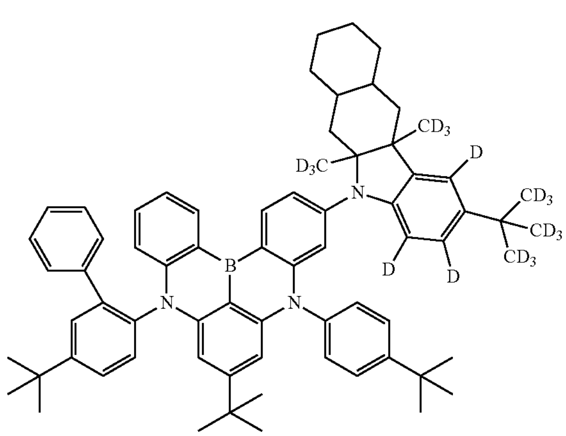
-continued
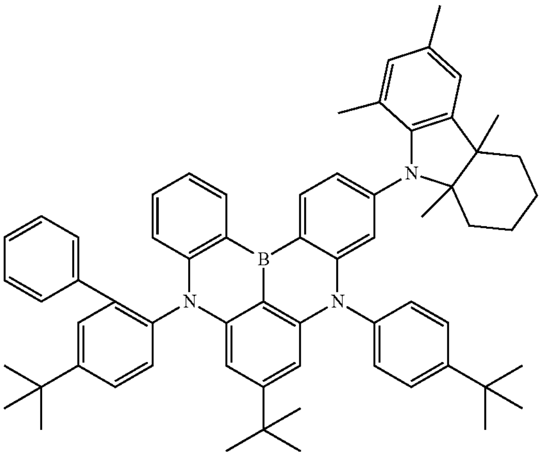
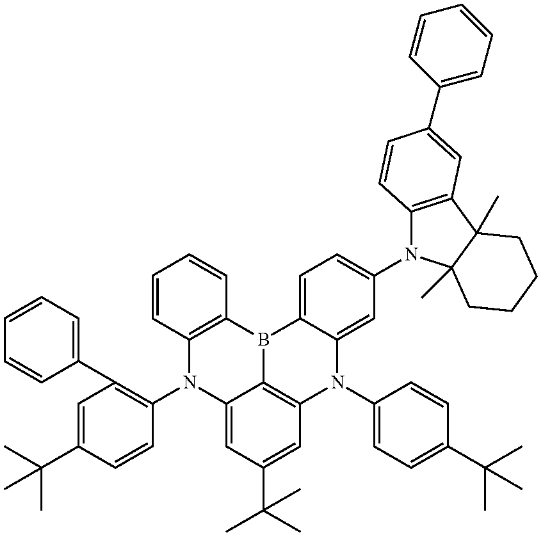
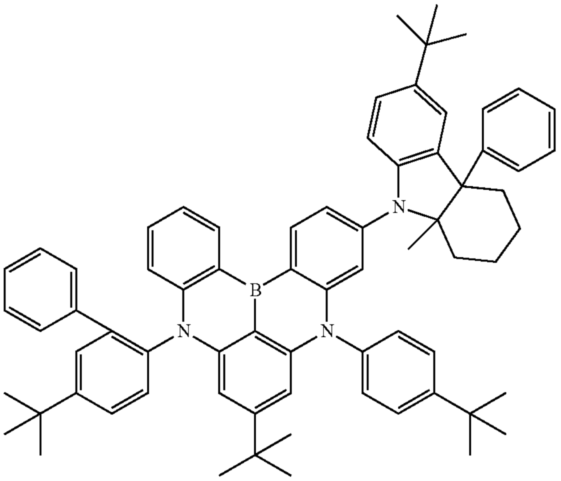

-continued
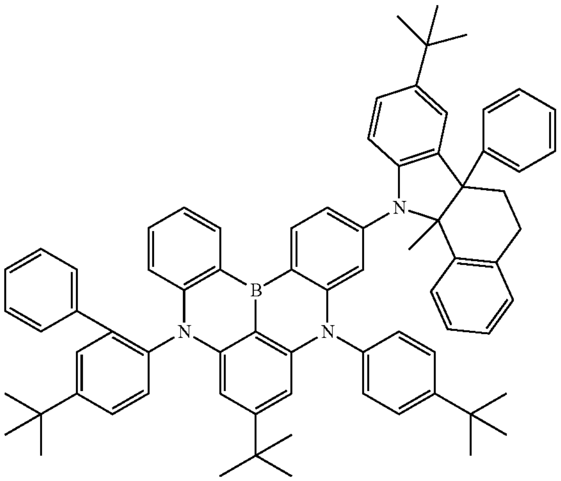
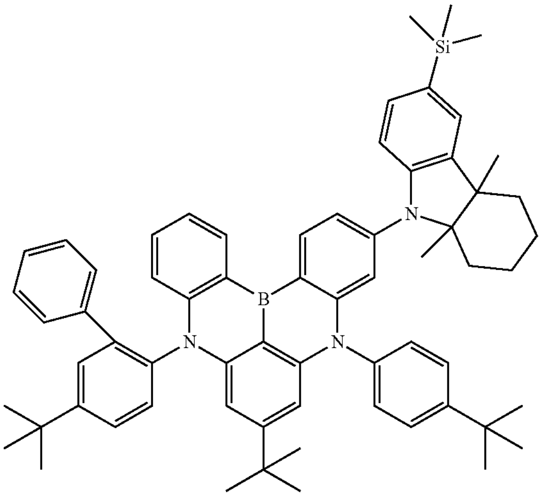
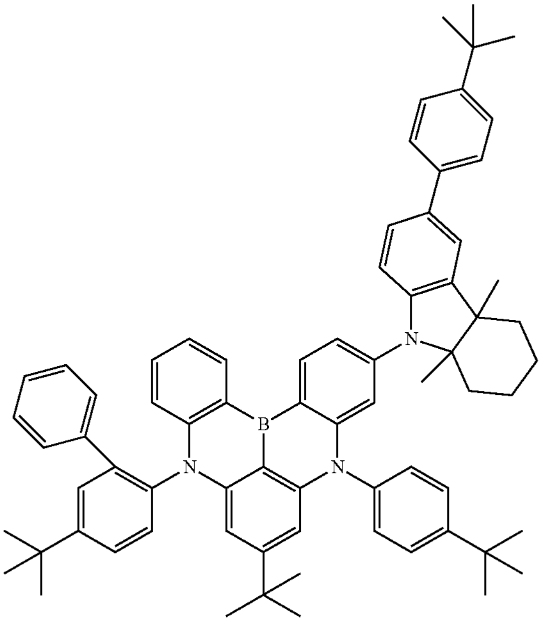
-continued
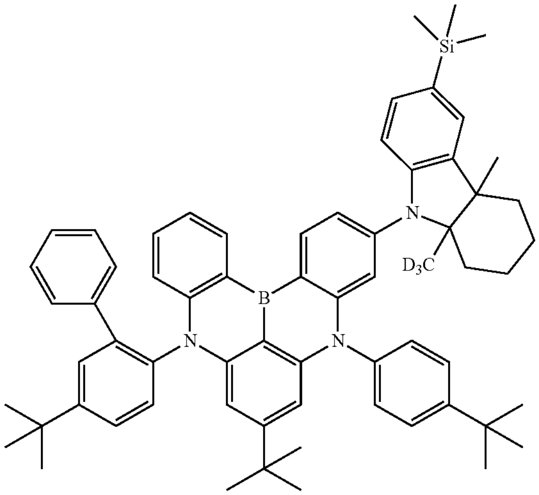
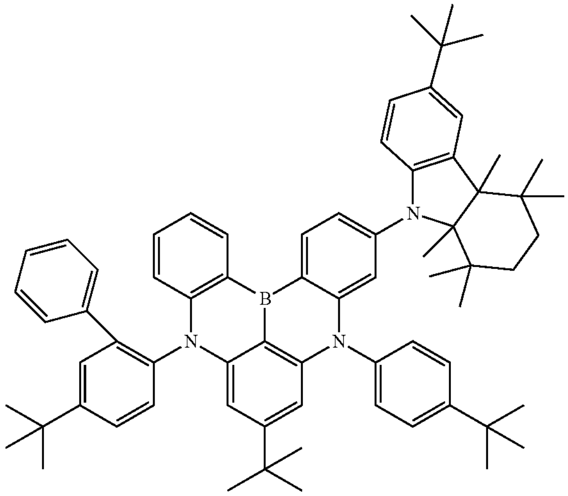
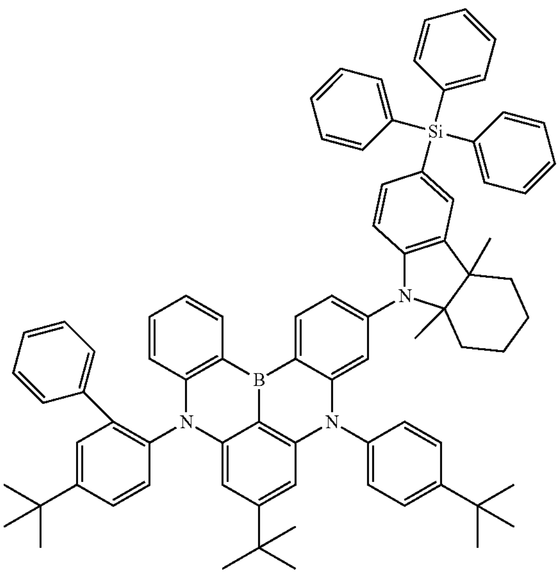

-continued
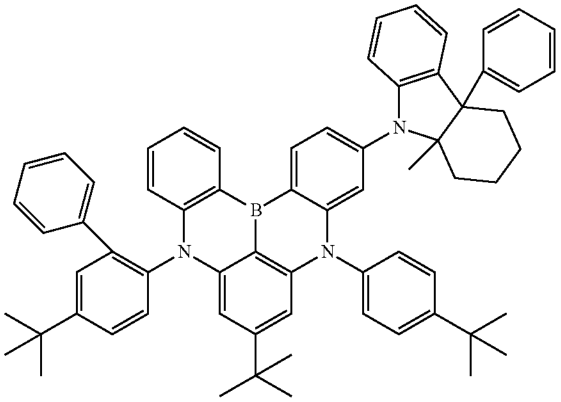
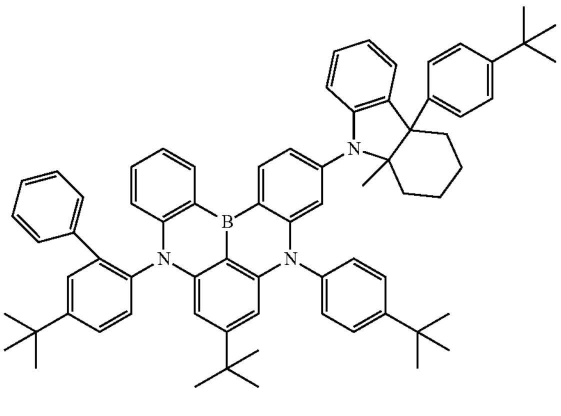
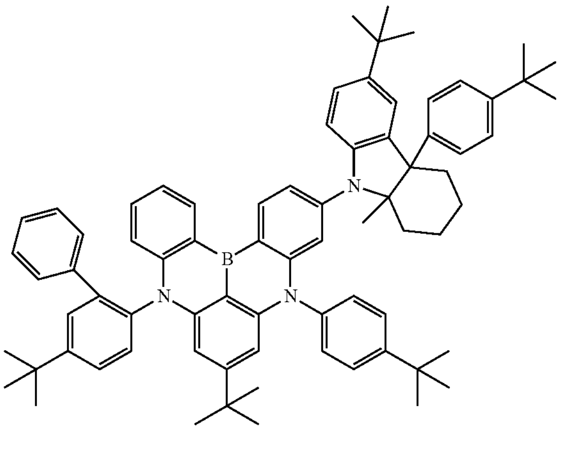
-continued
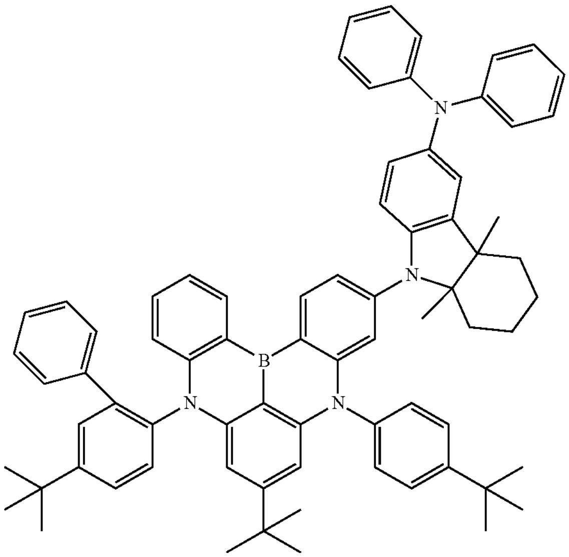
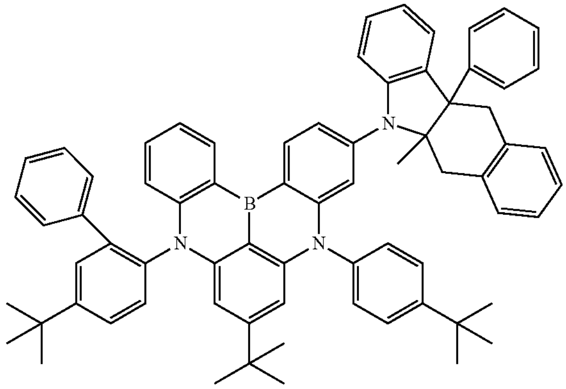
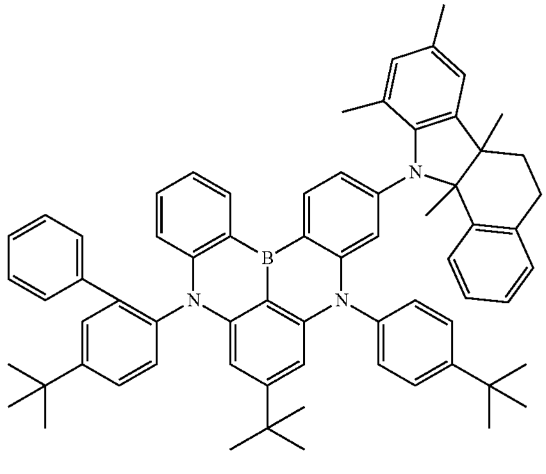

-continued
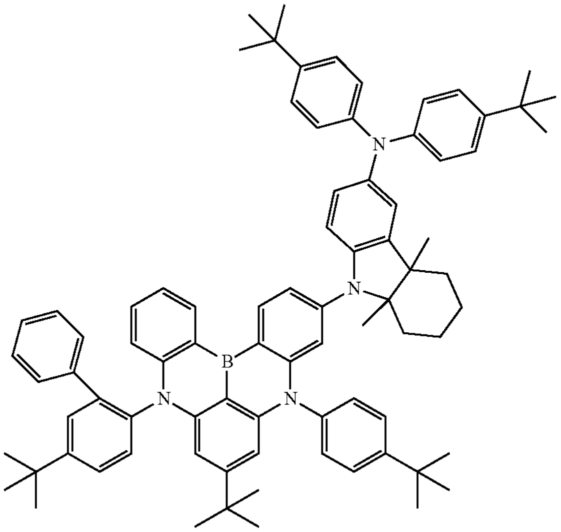
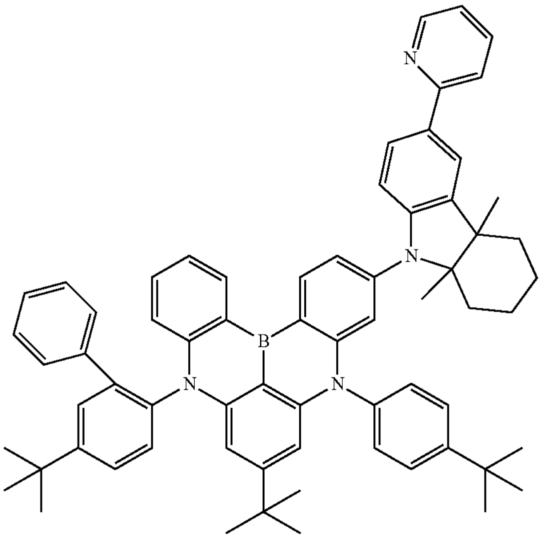
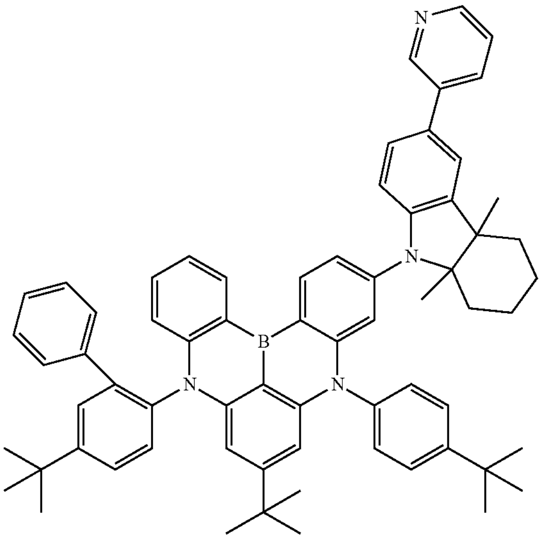
-continued
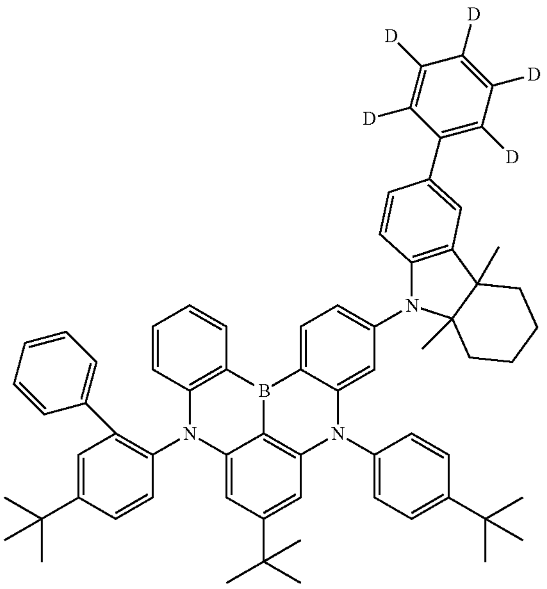
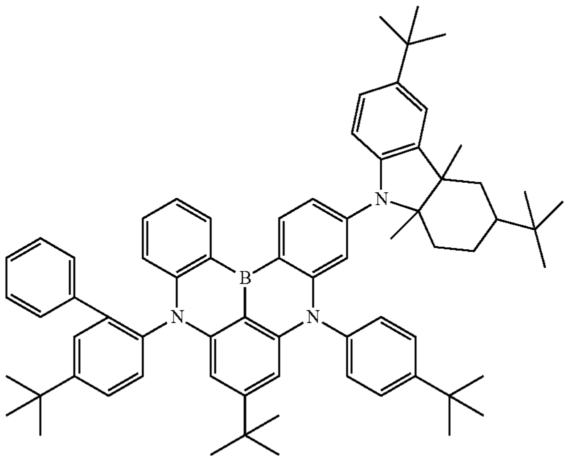
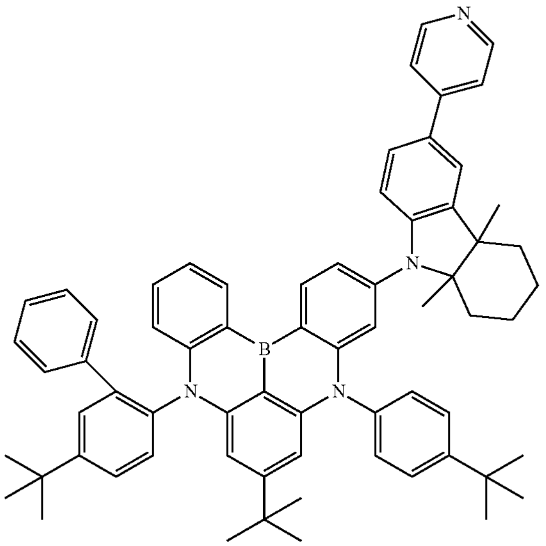

-continued
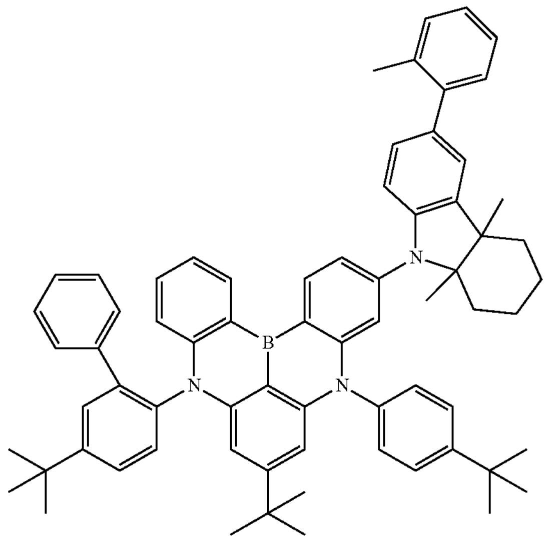
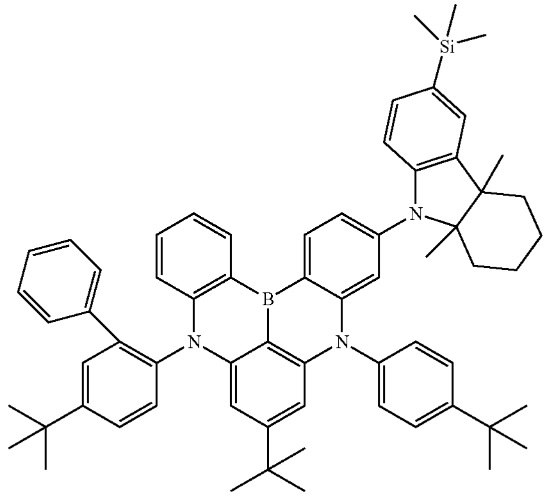
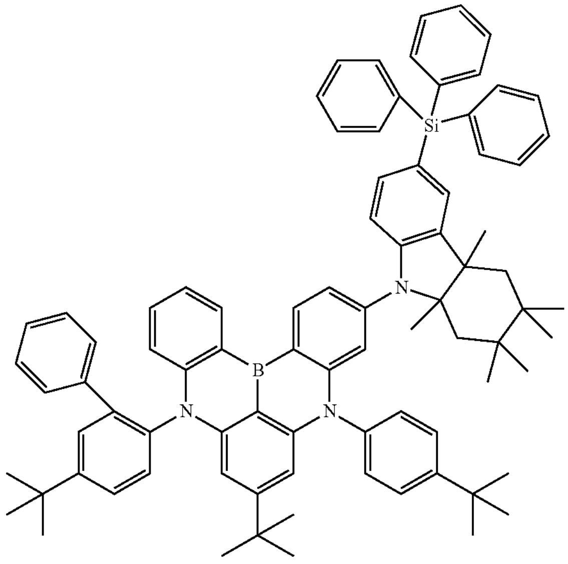
-continued
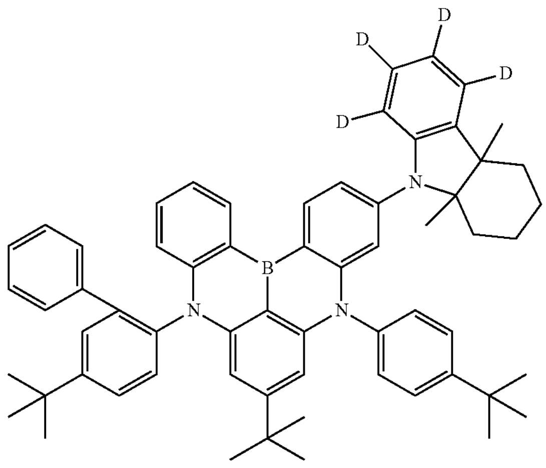
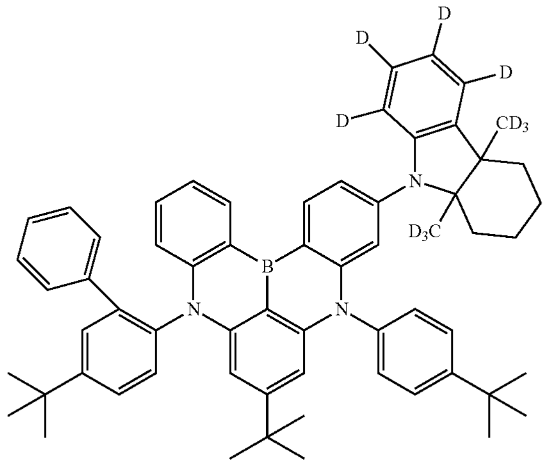
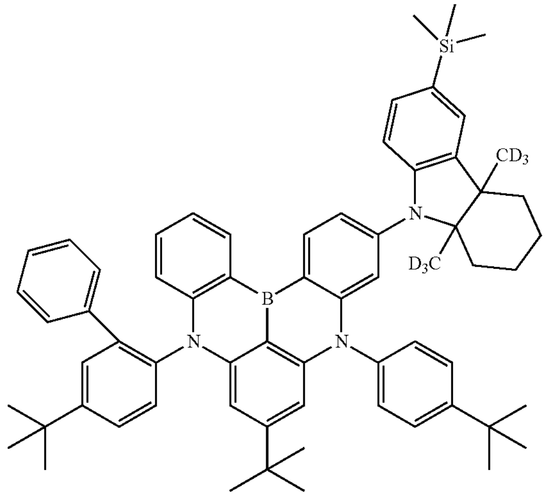

-continued
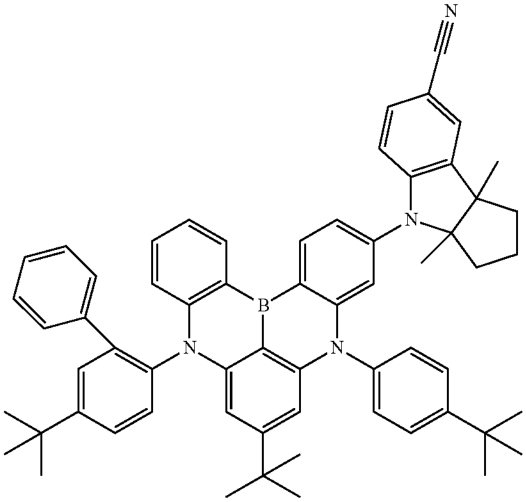
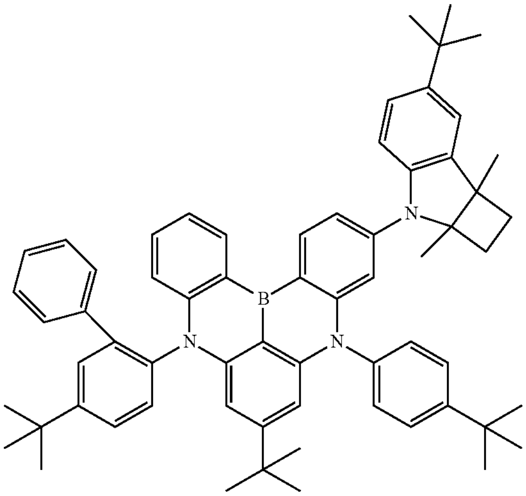
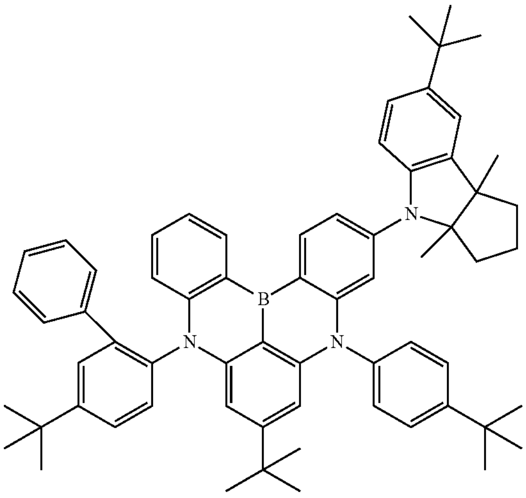
-continued
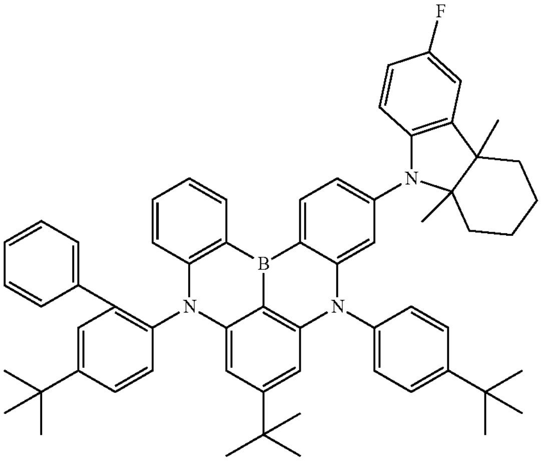
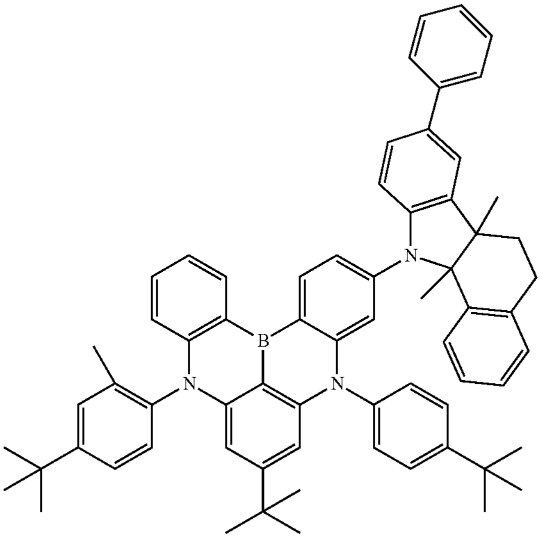
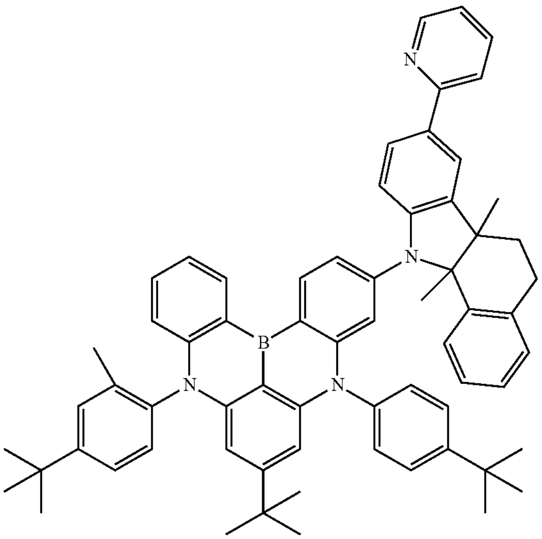

-continued
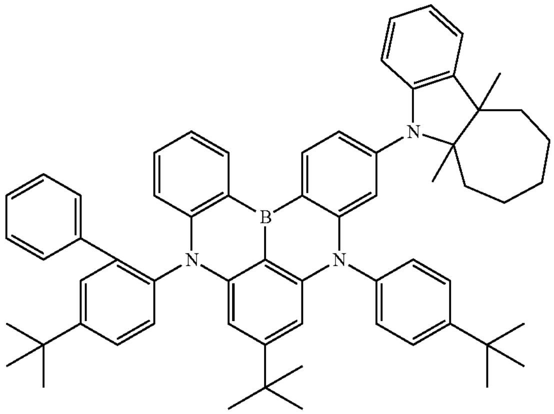
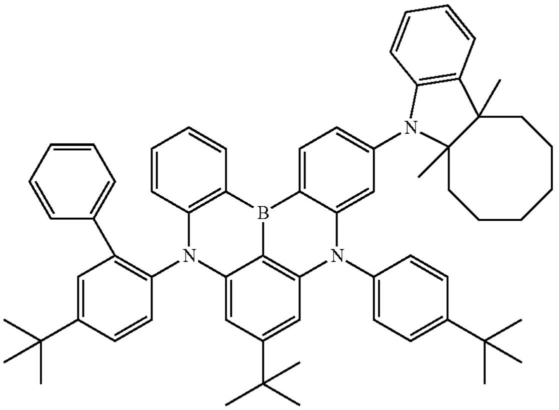
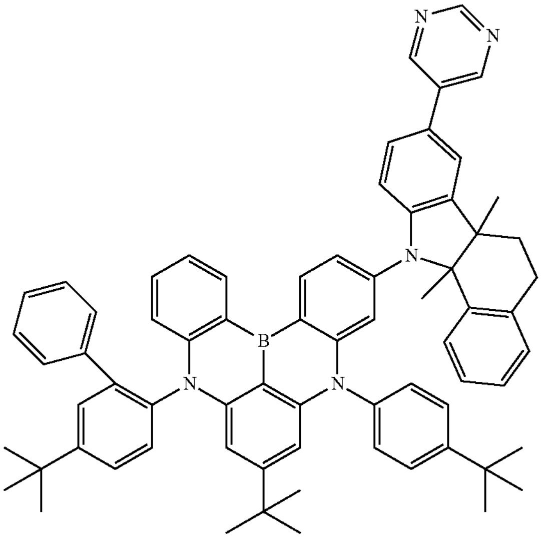
-continued
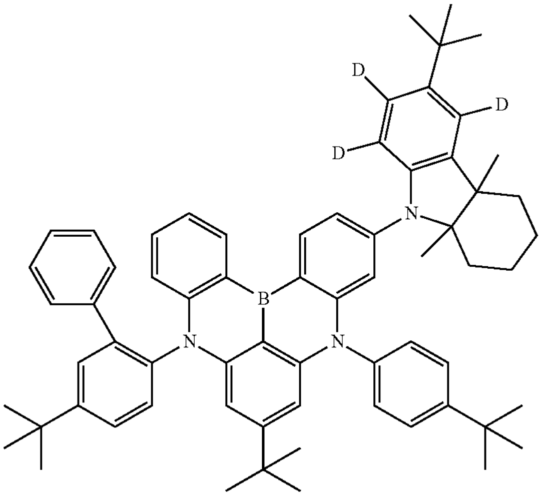
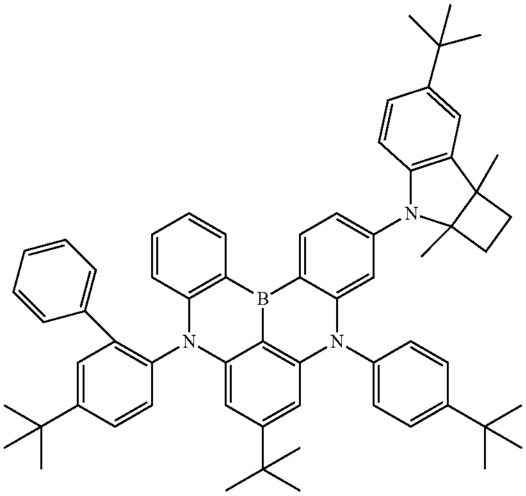
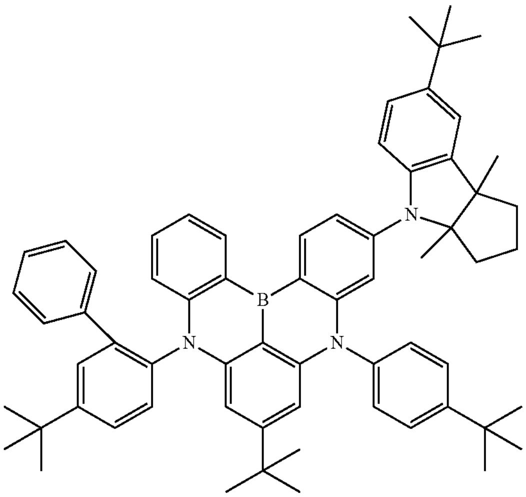

-continued
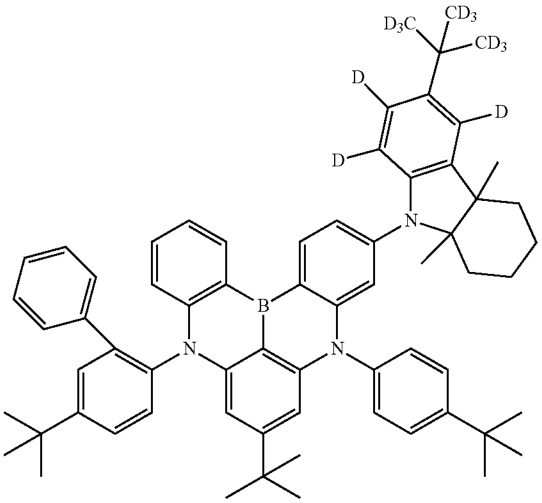
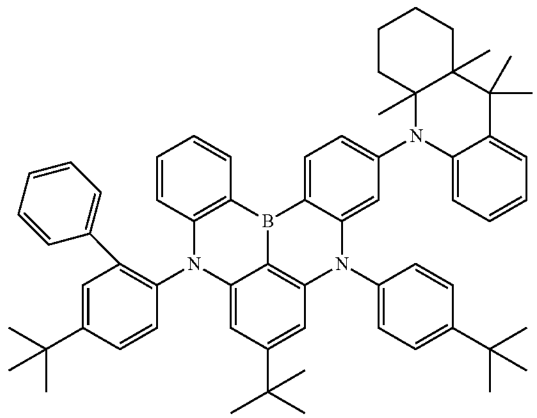
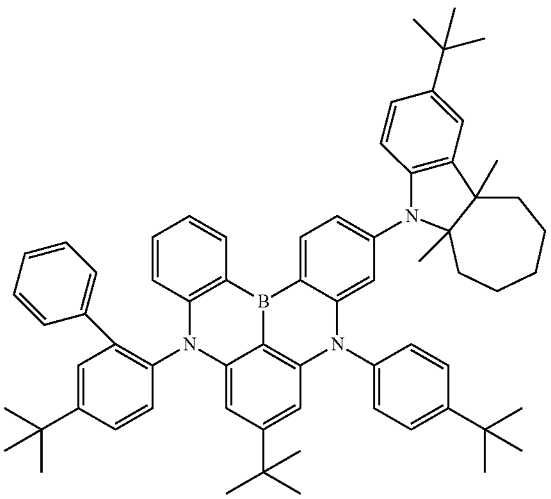
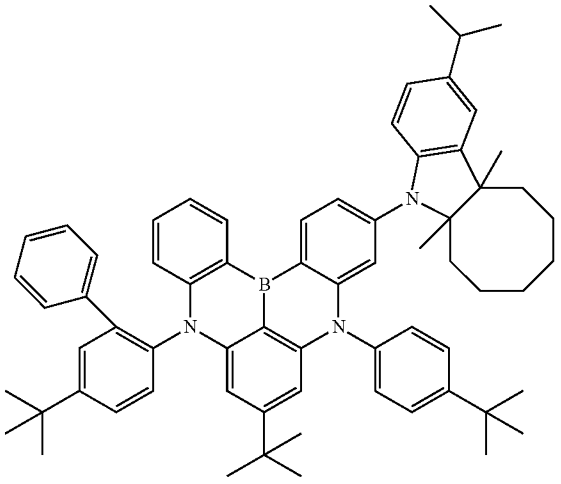
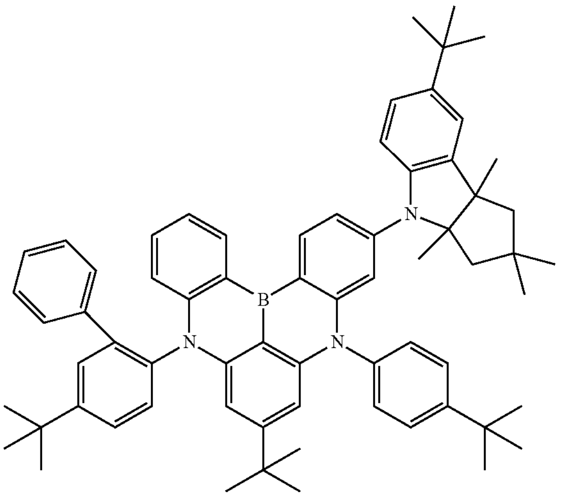
-continued
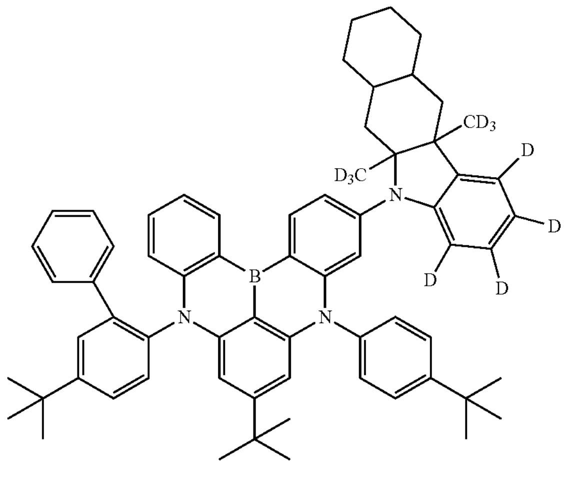

-continued
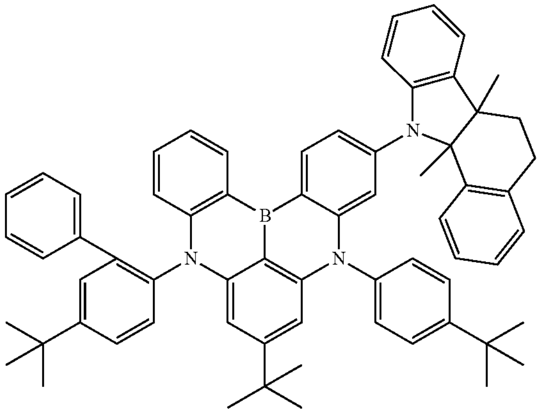
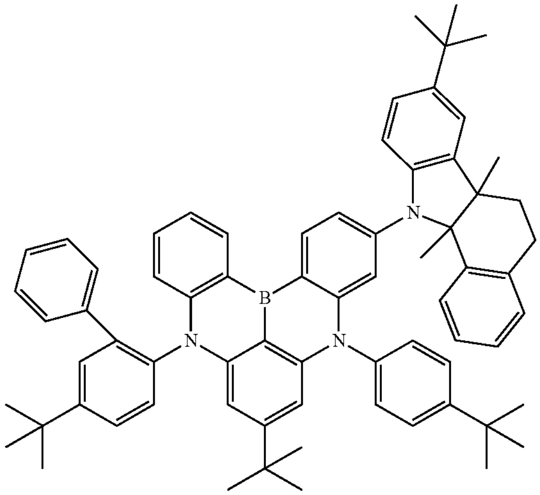
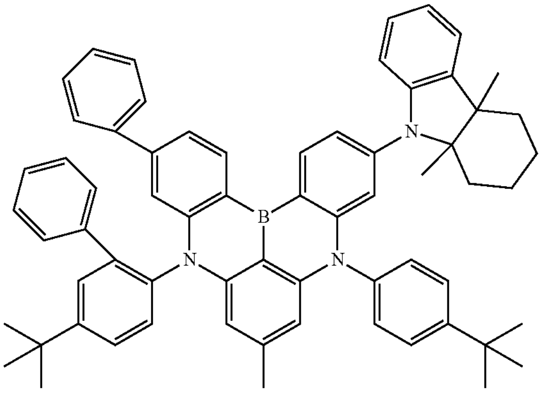
-continued
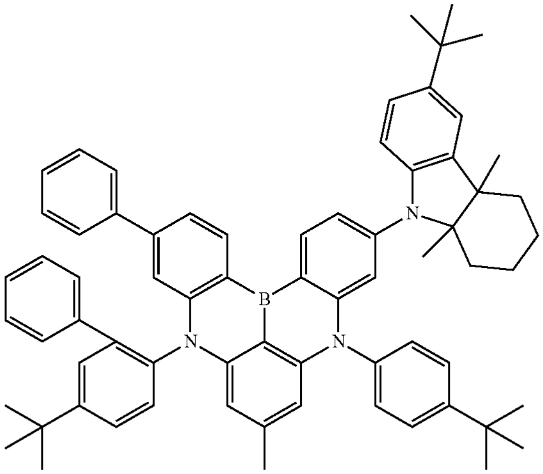
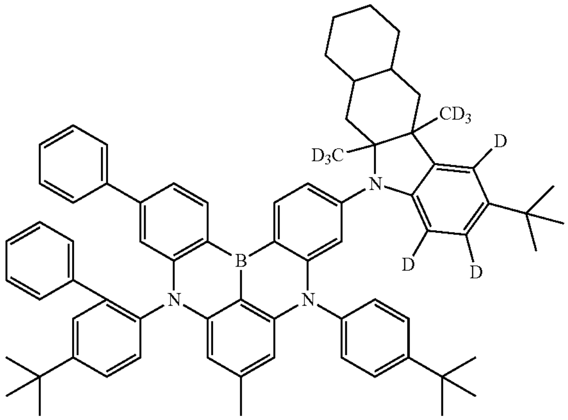
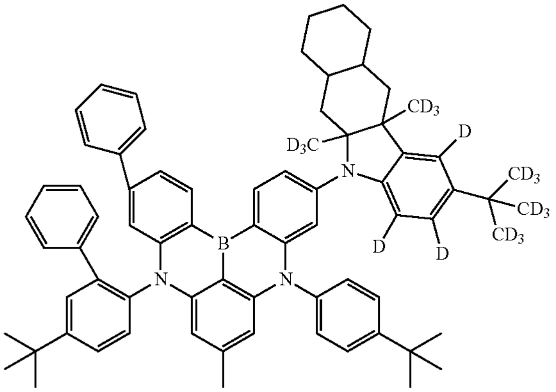
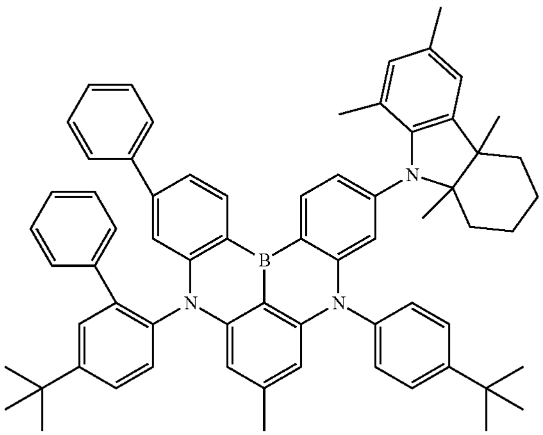

-continued
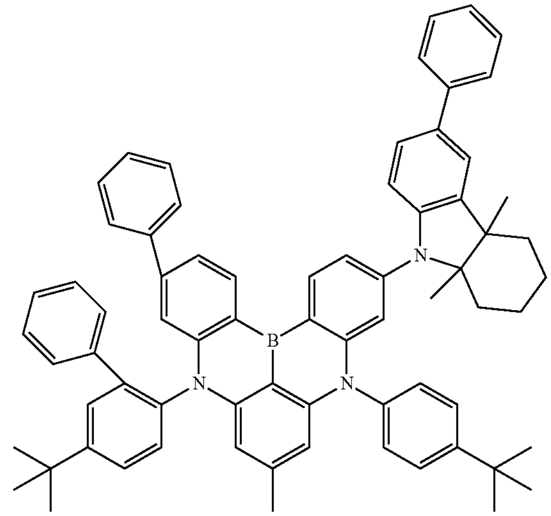
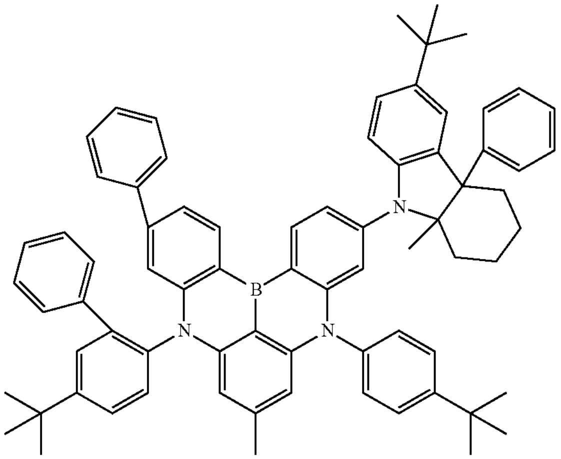
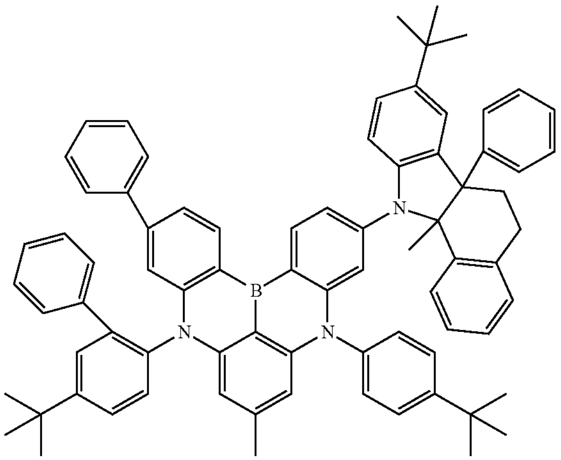
-continued
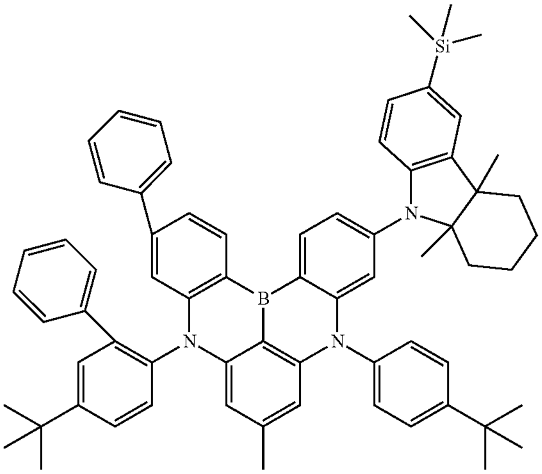
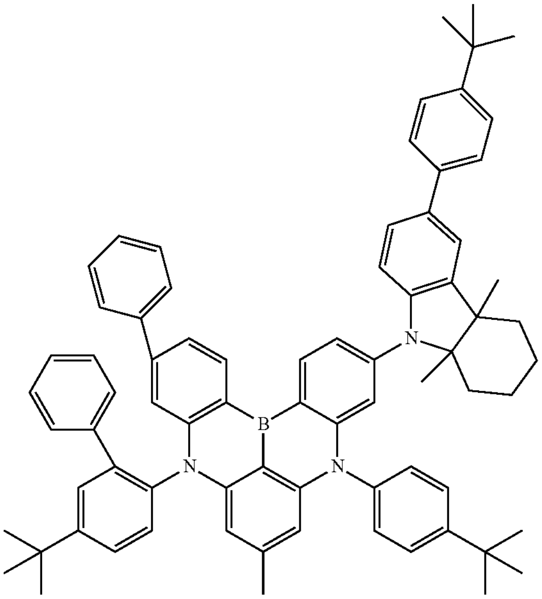
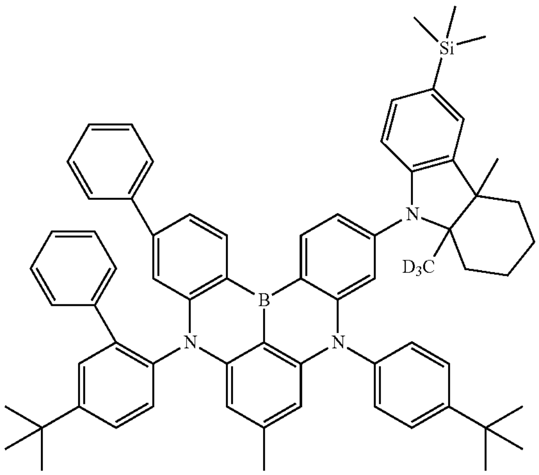

-continued
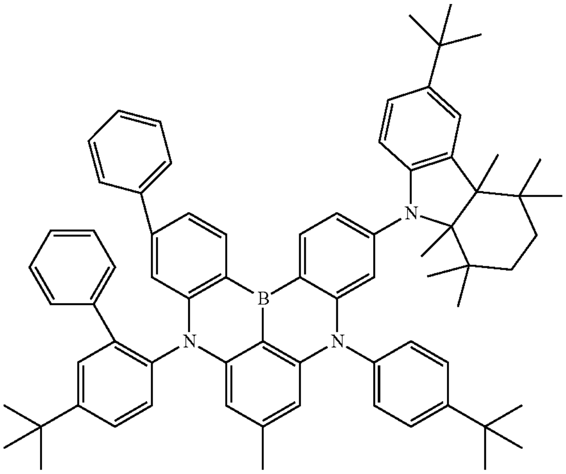
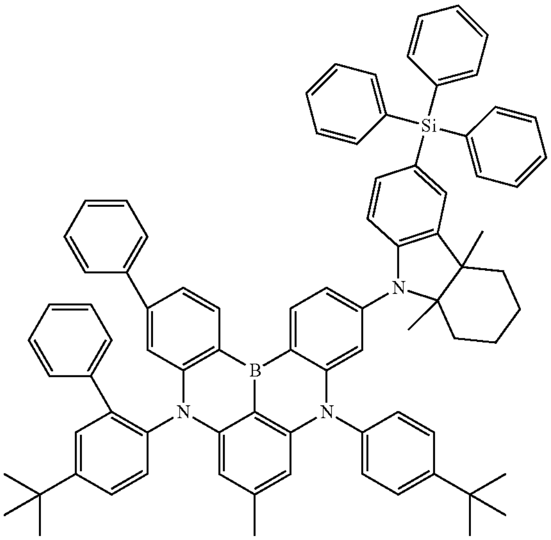
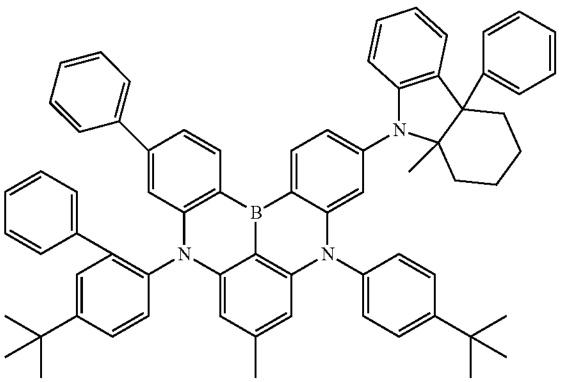
-continued
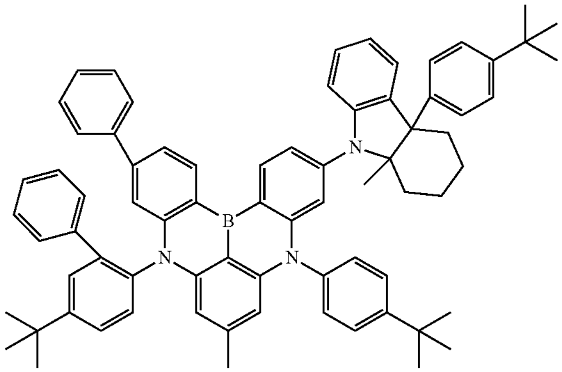
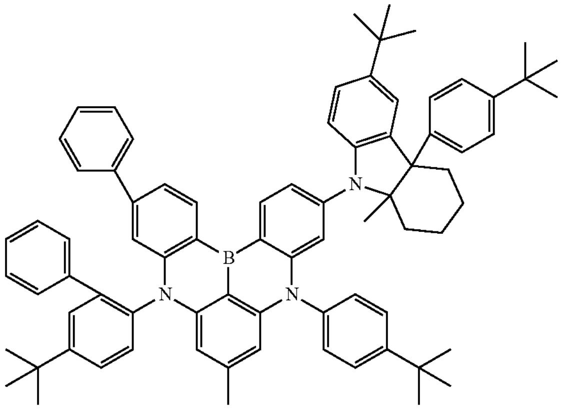
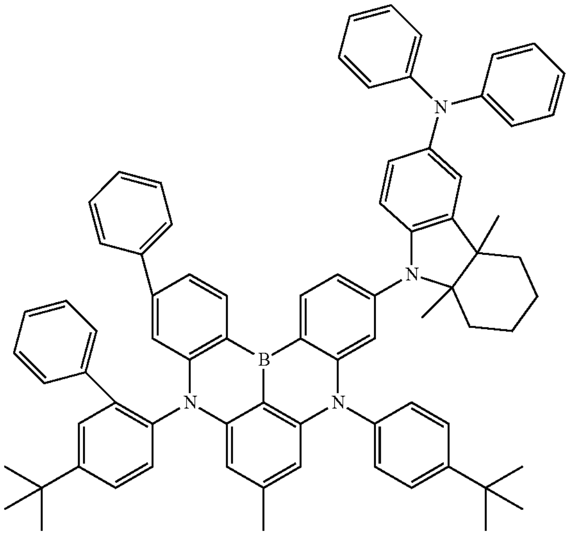
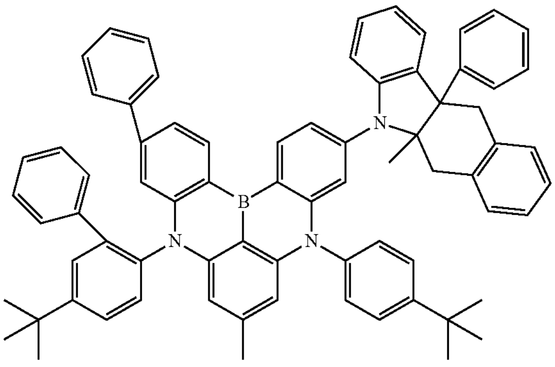

-continued
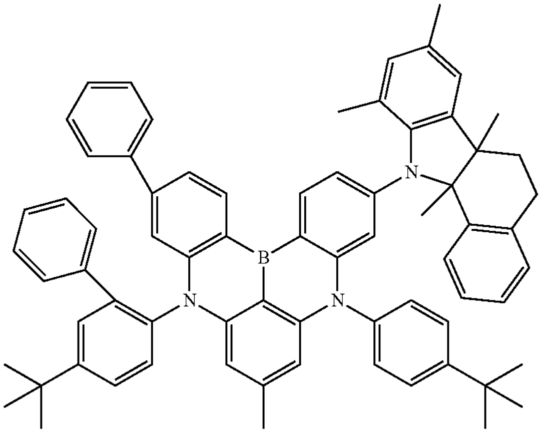
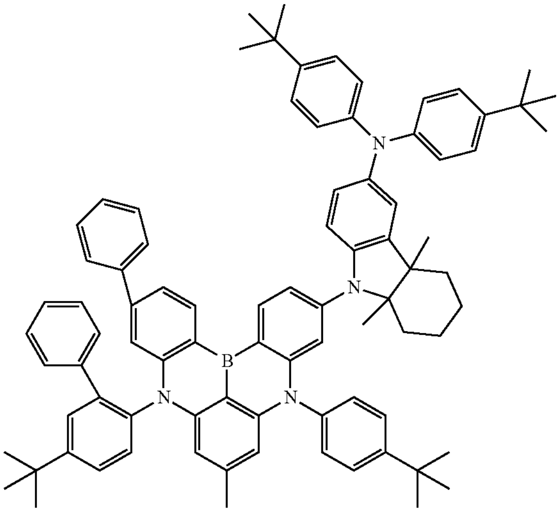
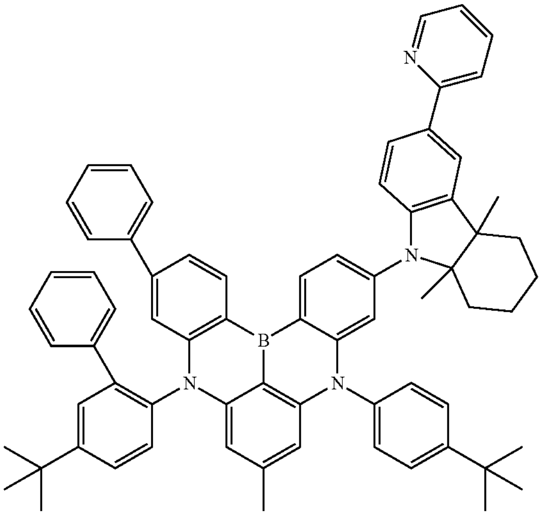
-continued
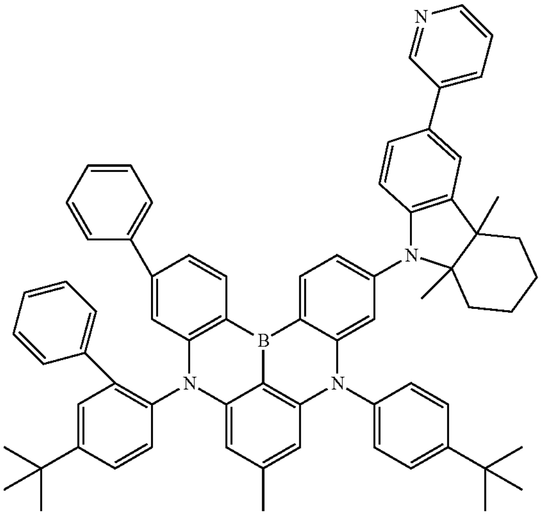
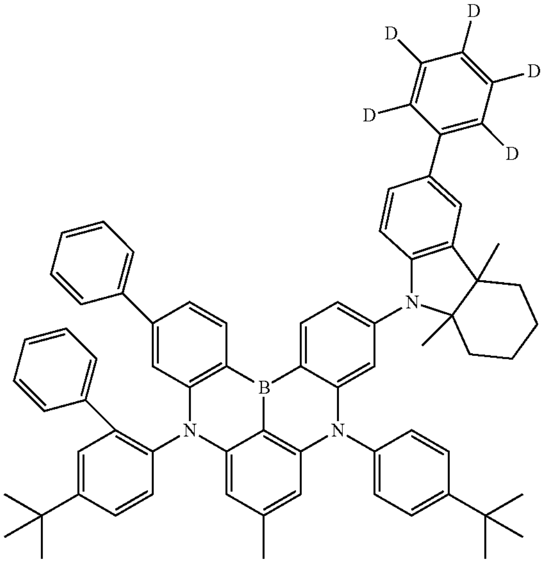
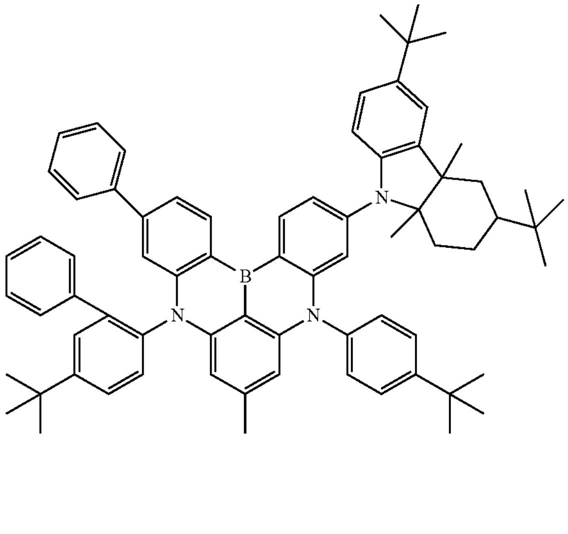

-continued
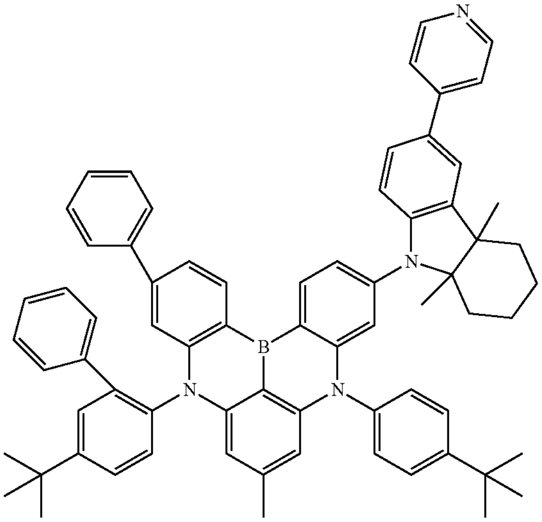
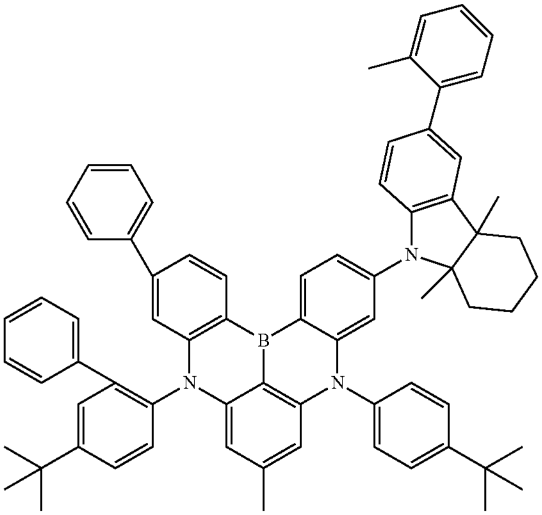
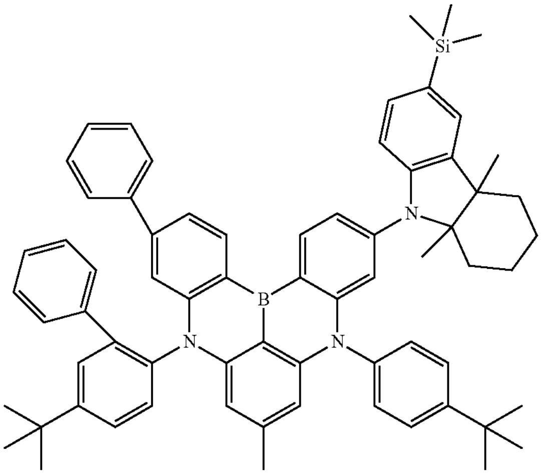
-continued
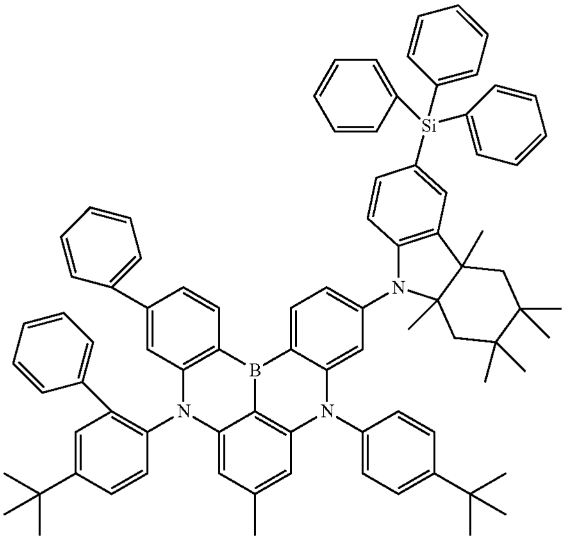
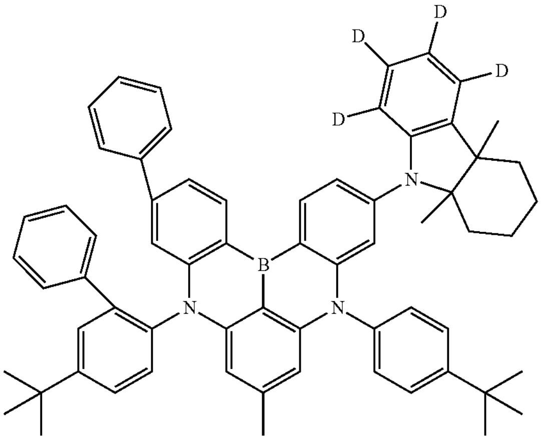
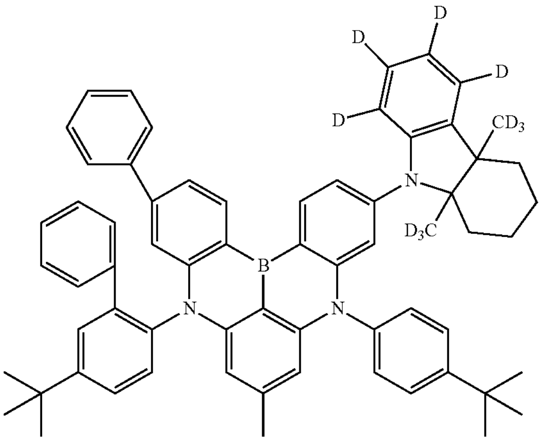

-continued
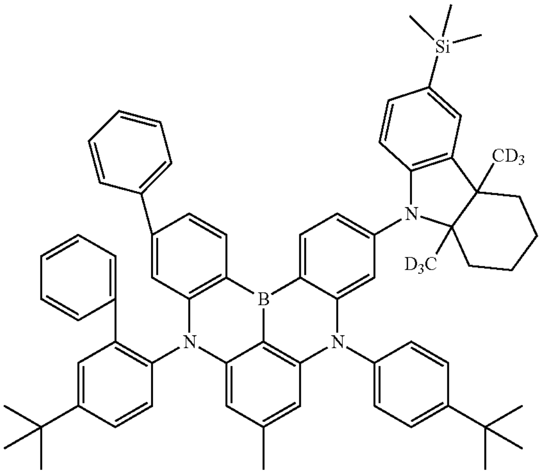
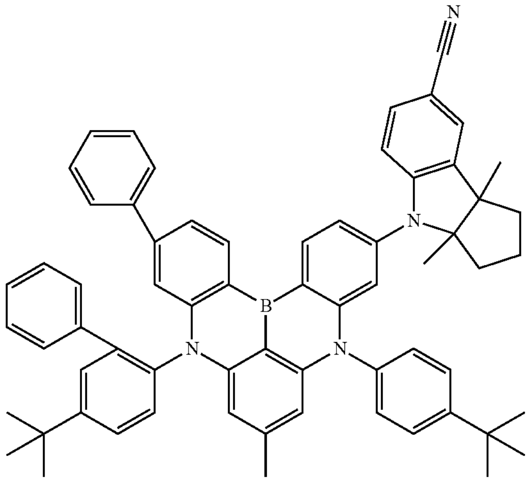
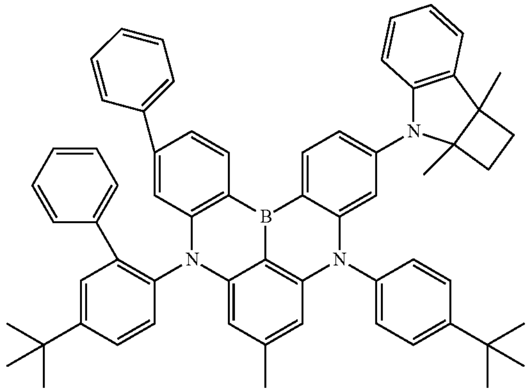
-continued
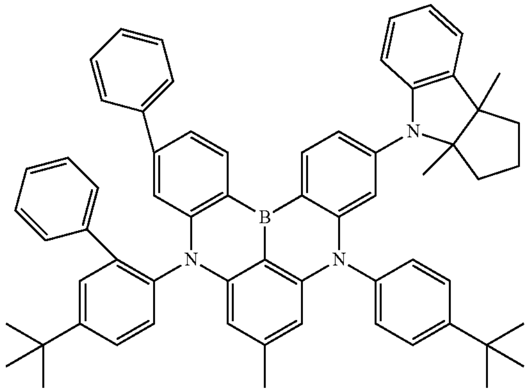
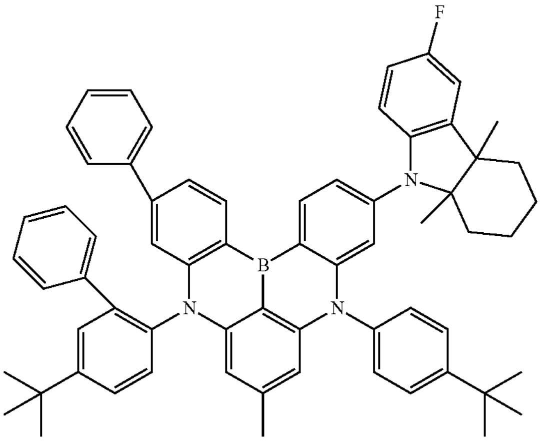
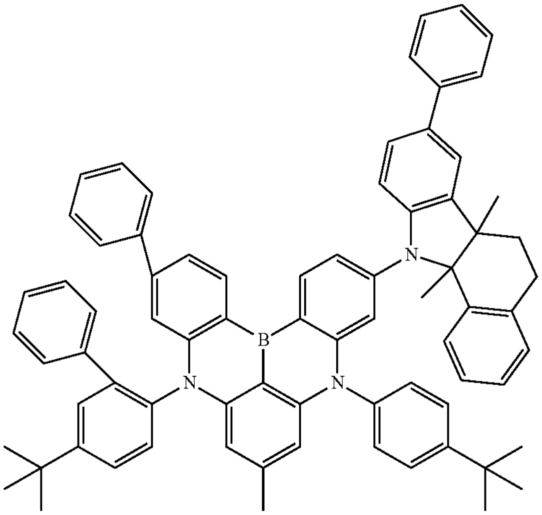

-continued
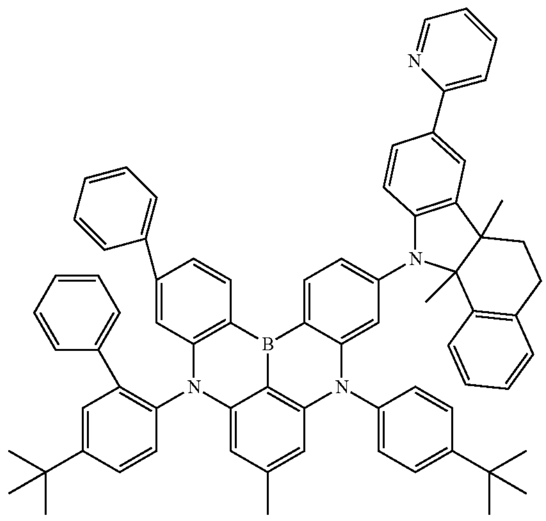
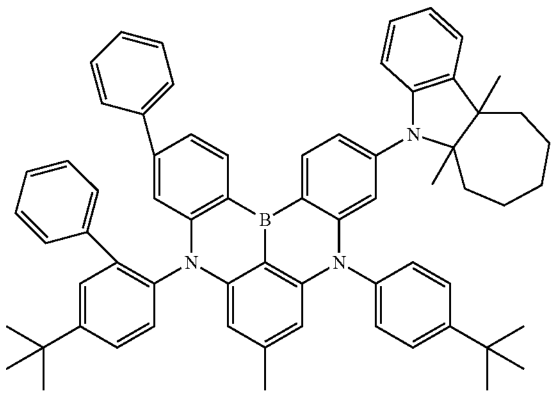
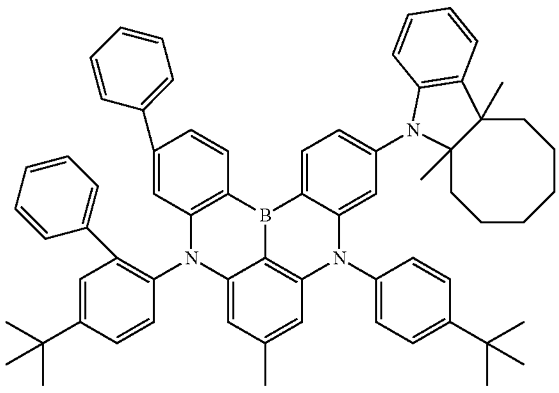
-continued
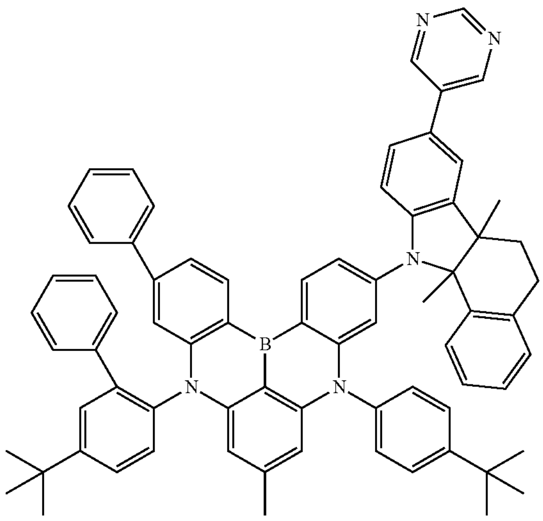
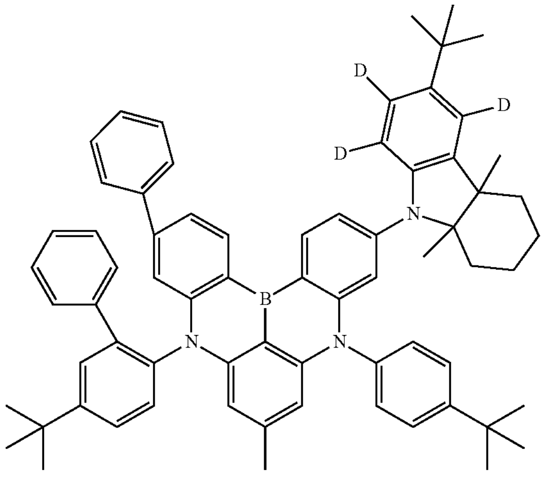
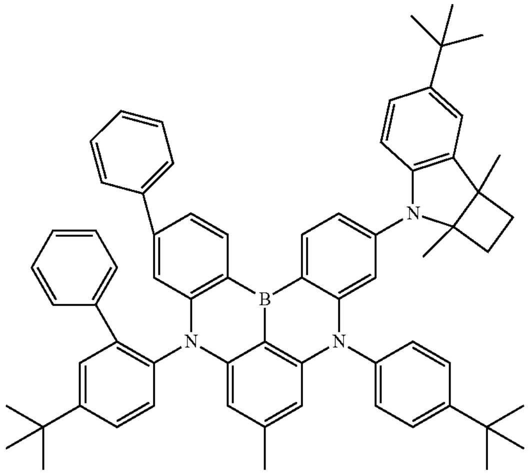

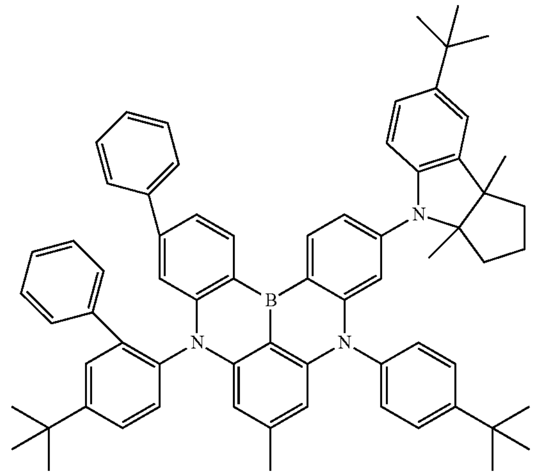
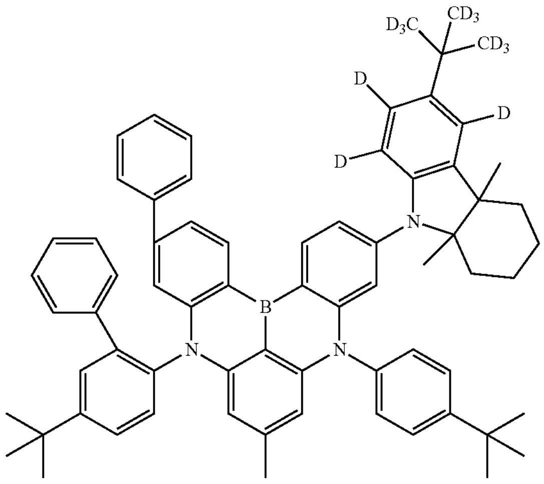
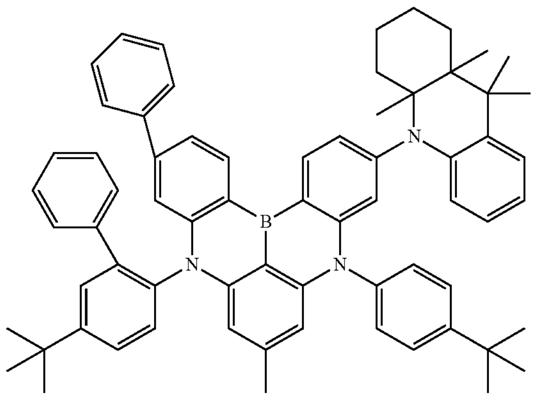
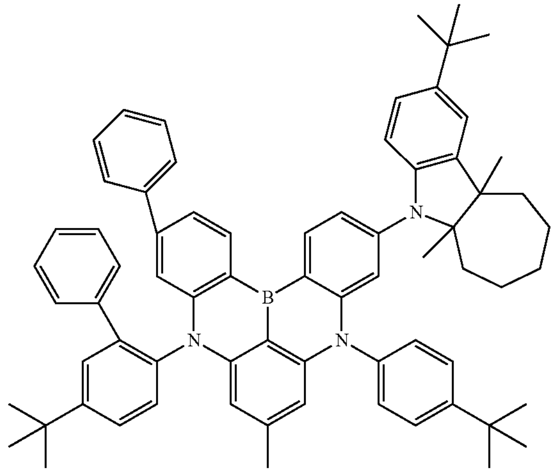
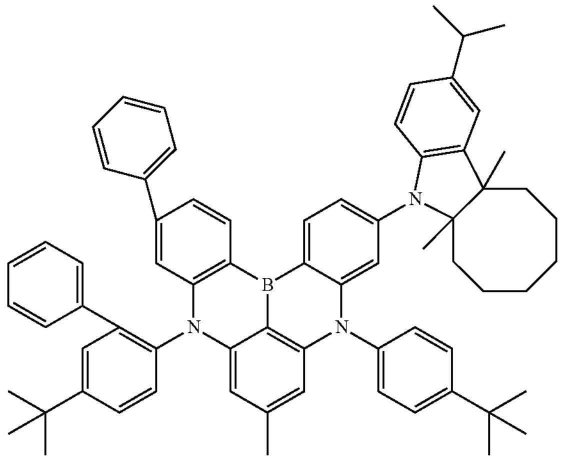
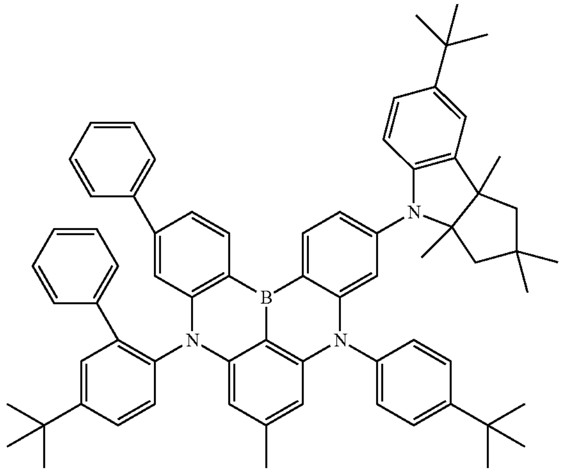

-continued
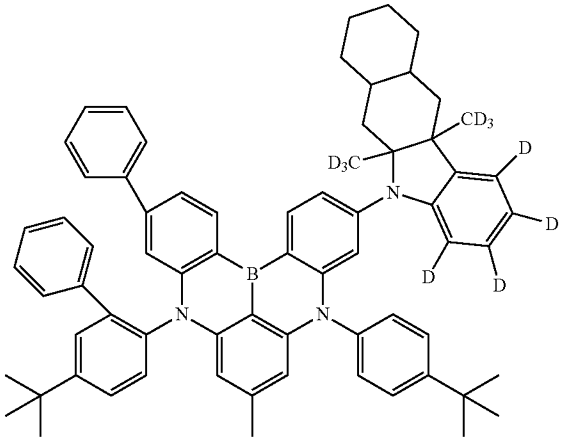
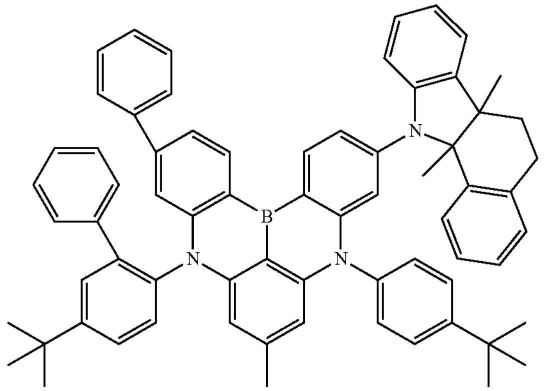
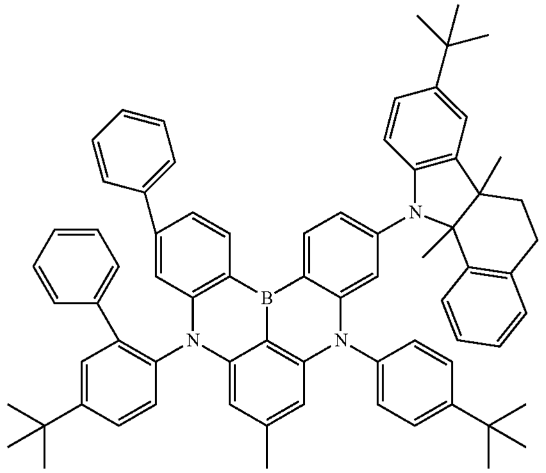
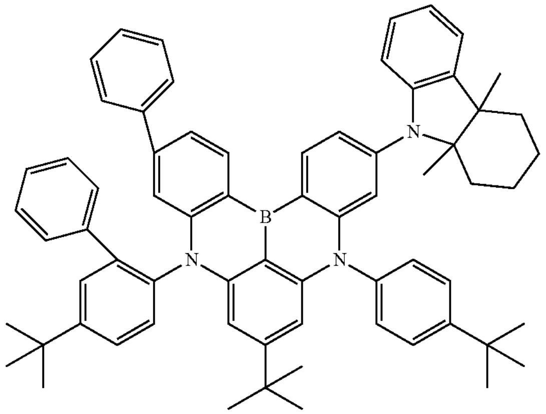
-continued
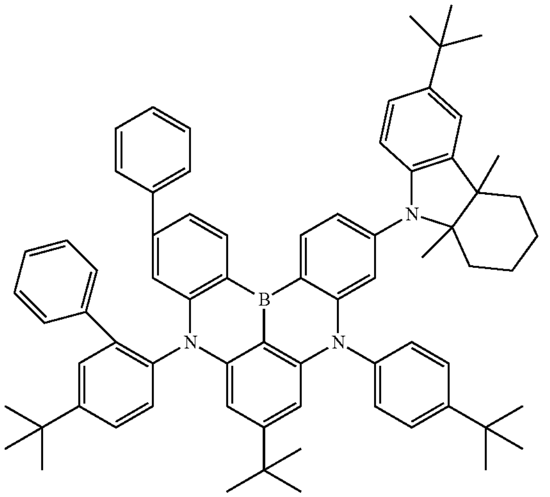
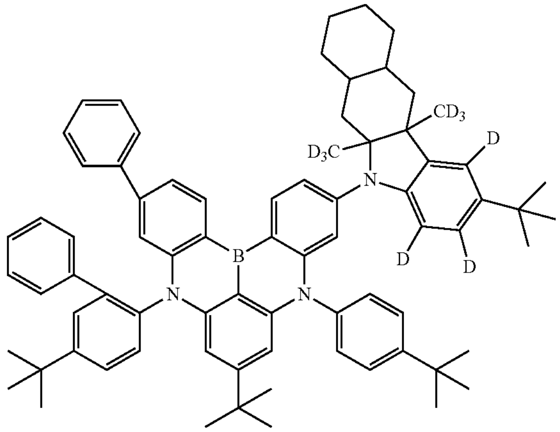
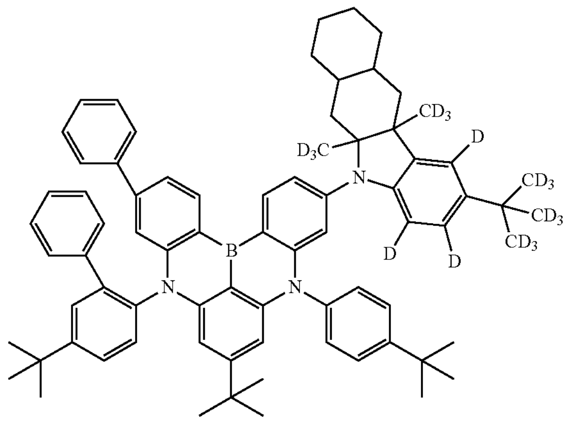

-continued
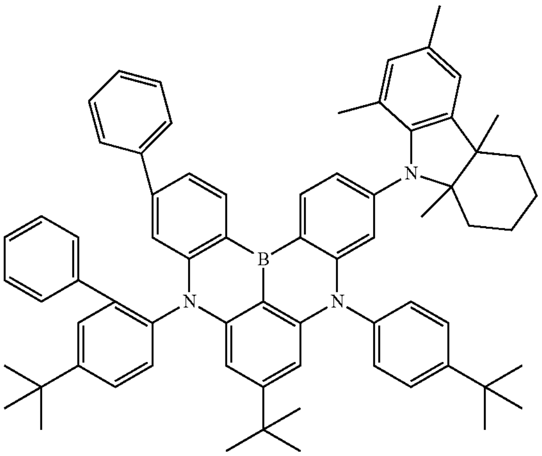
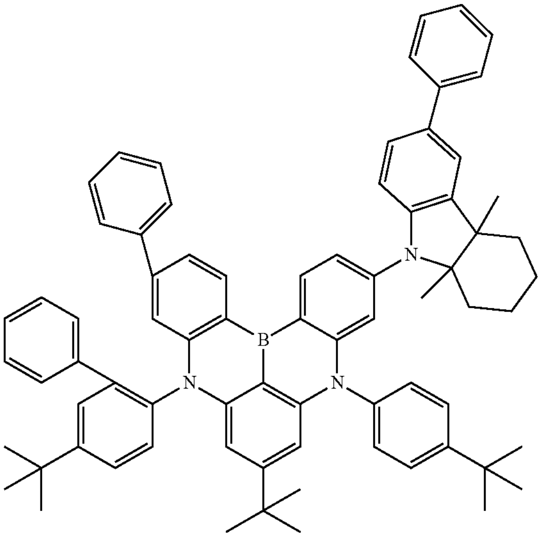
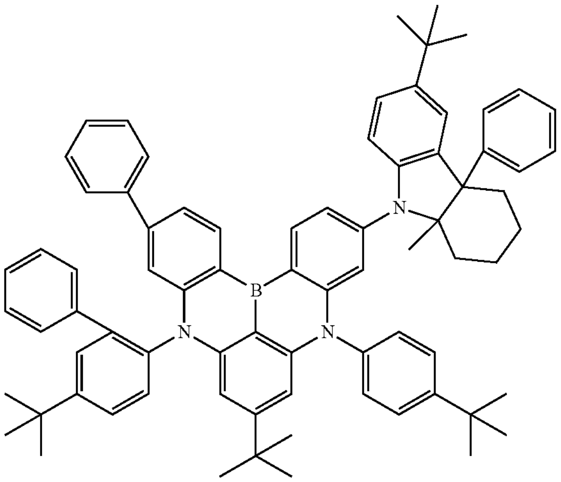
-continued
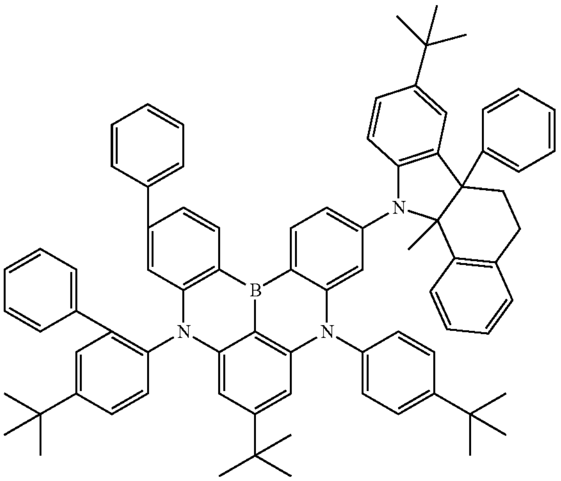
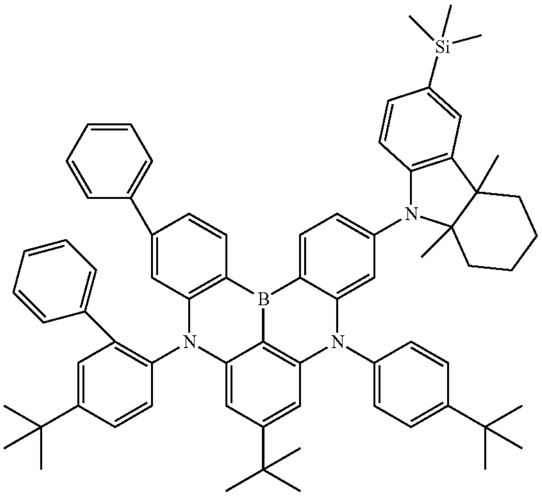
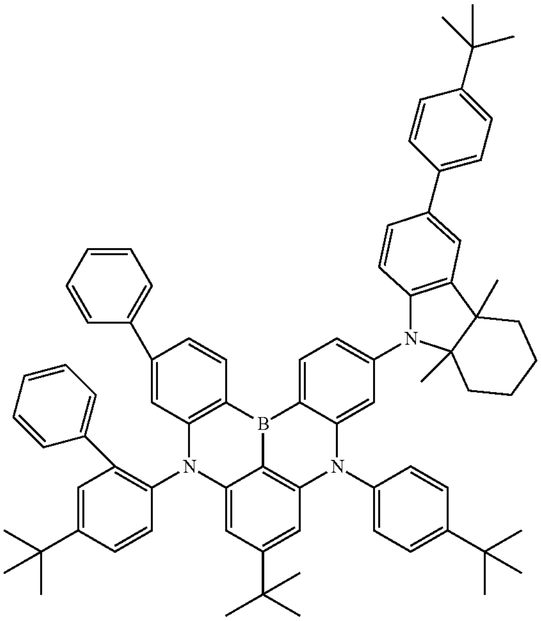

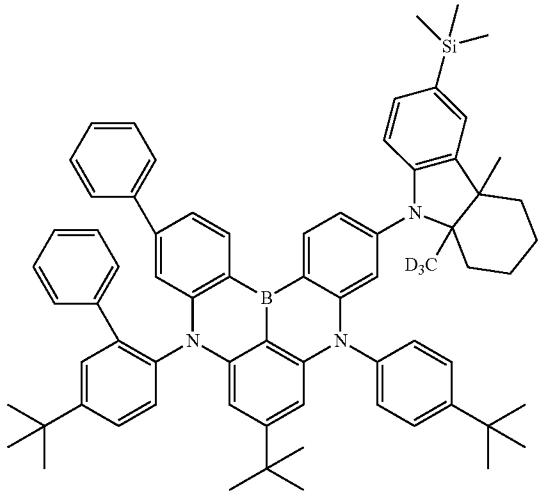
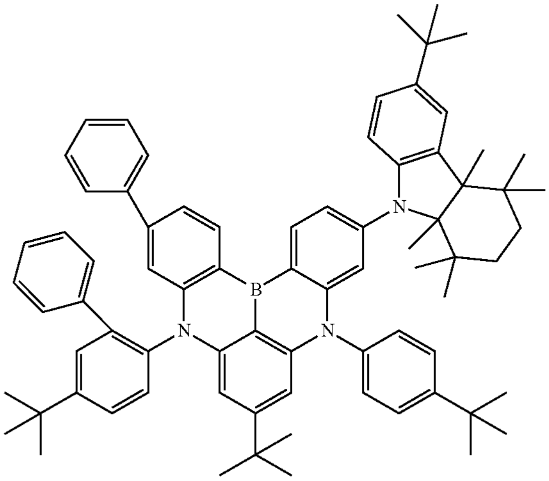
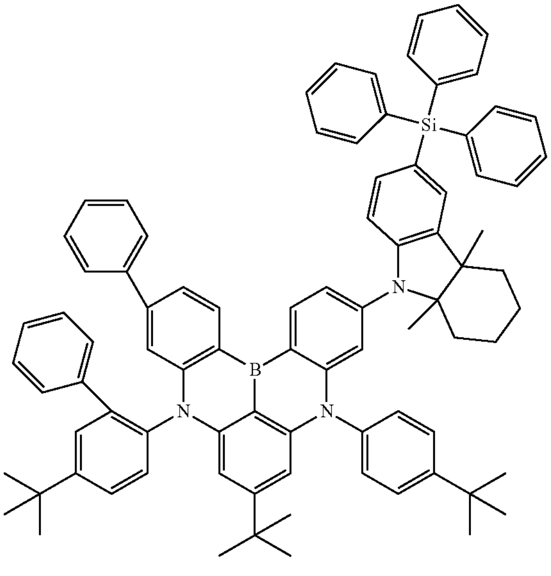
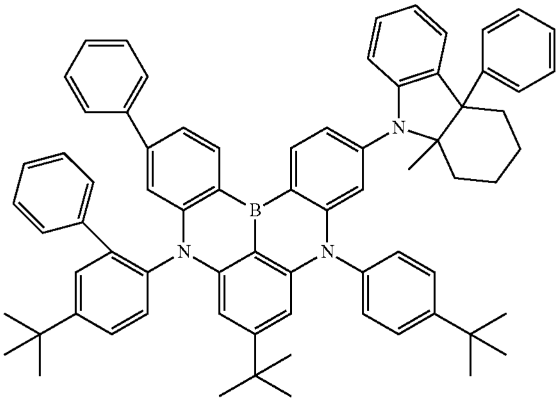
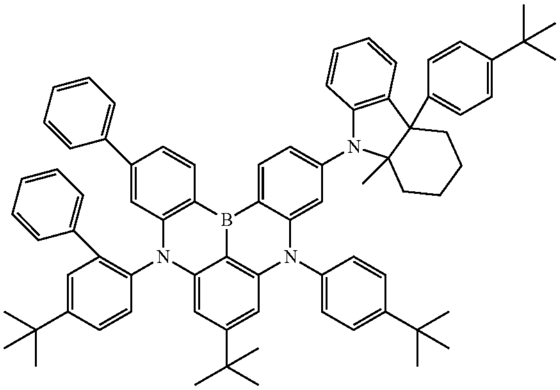
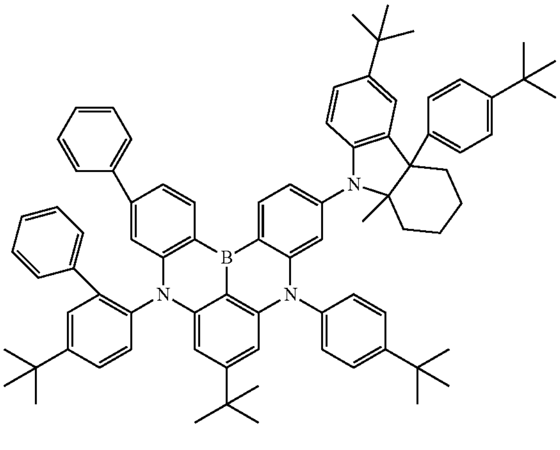

-continued
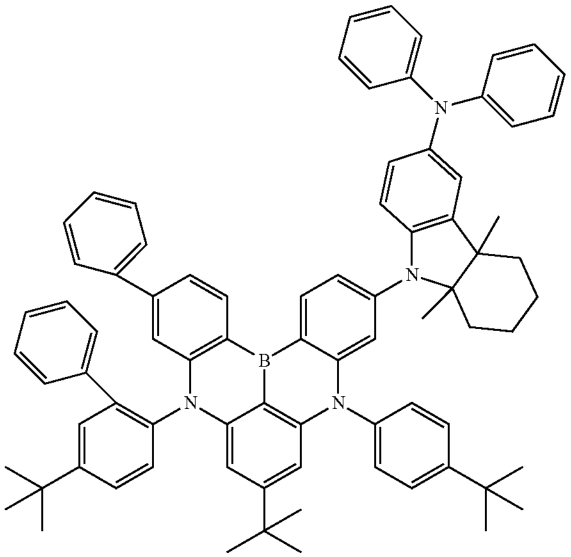
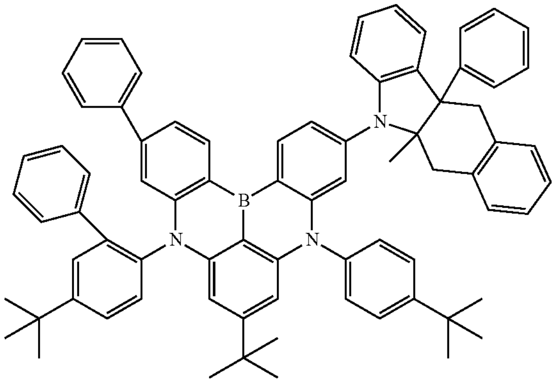
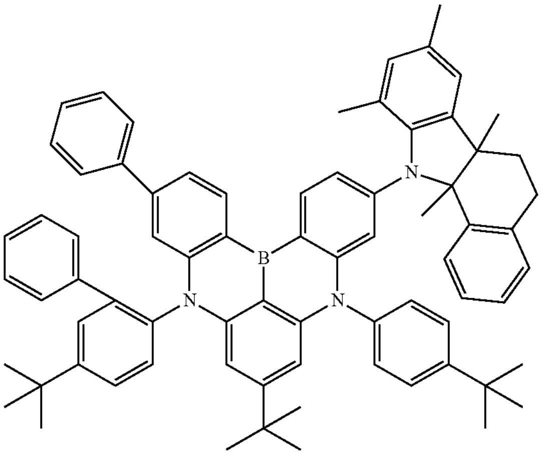
-continued
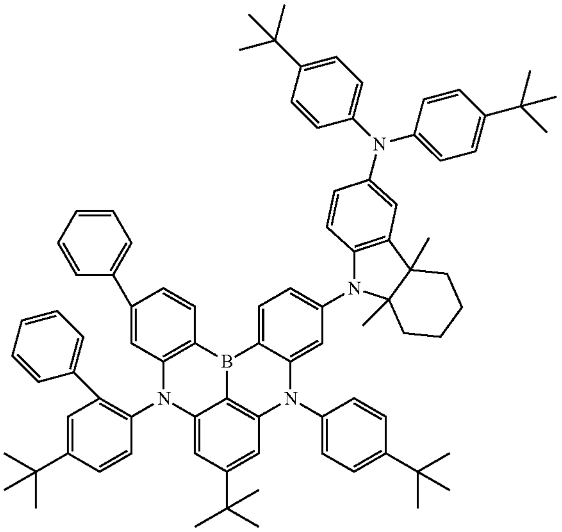
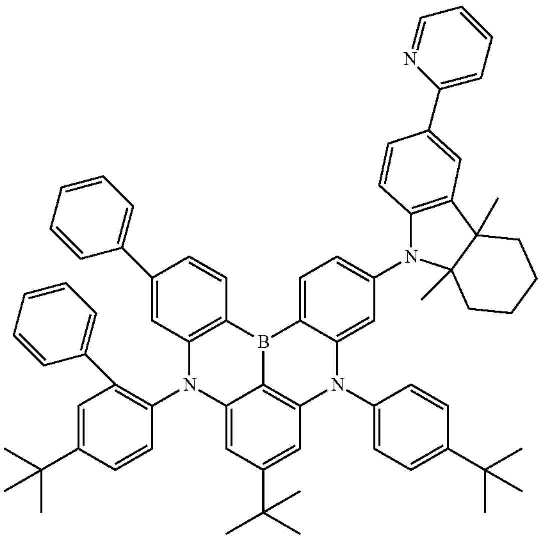
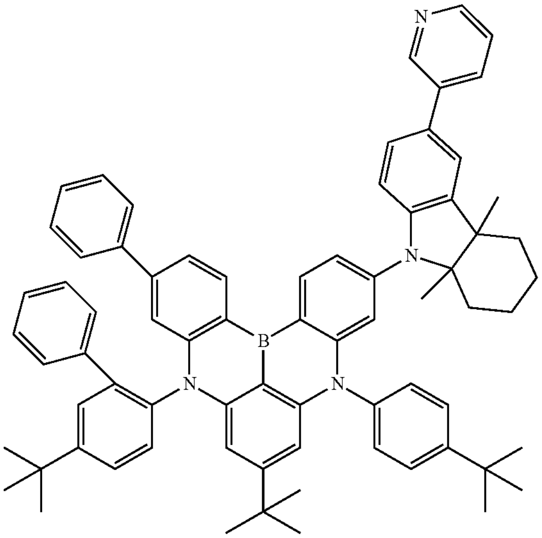

-continued
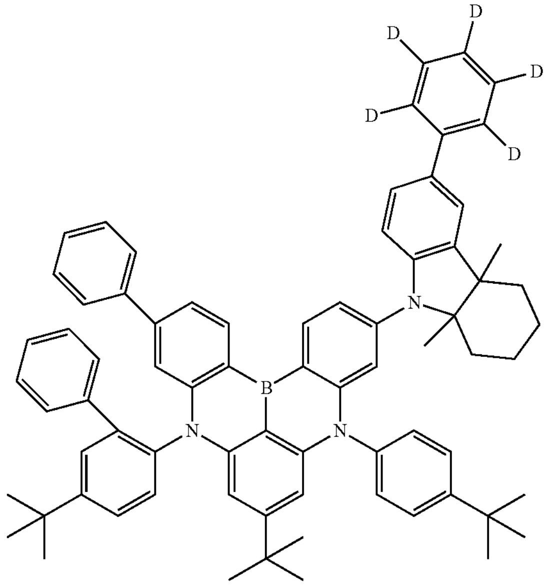
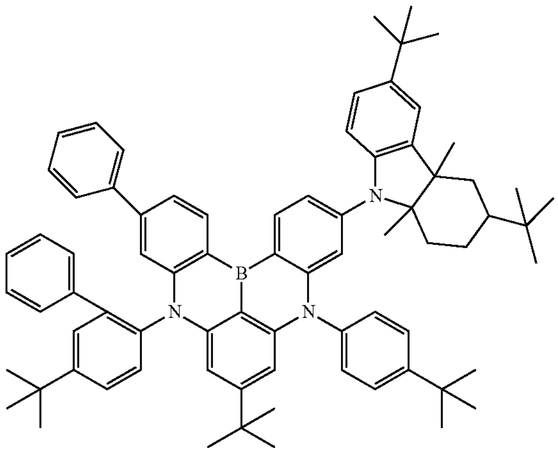
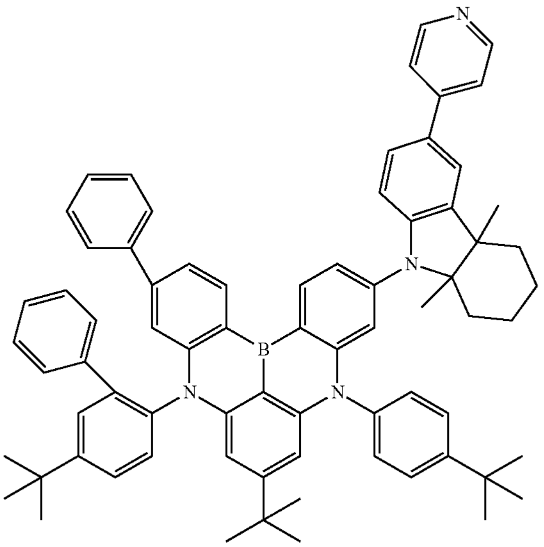
-continued
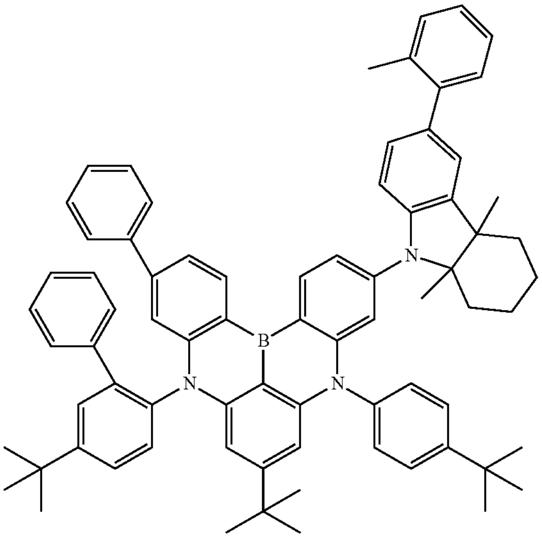
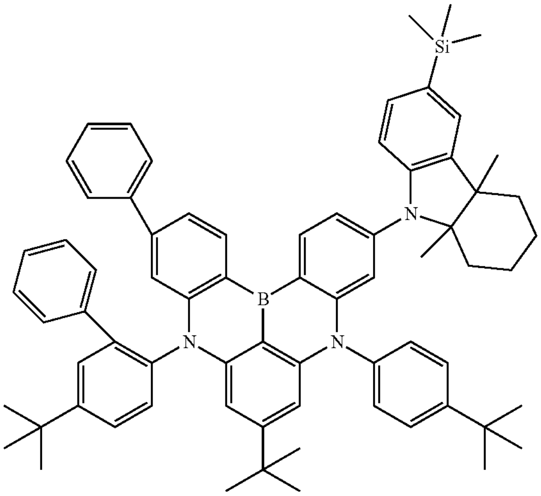
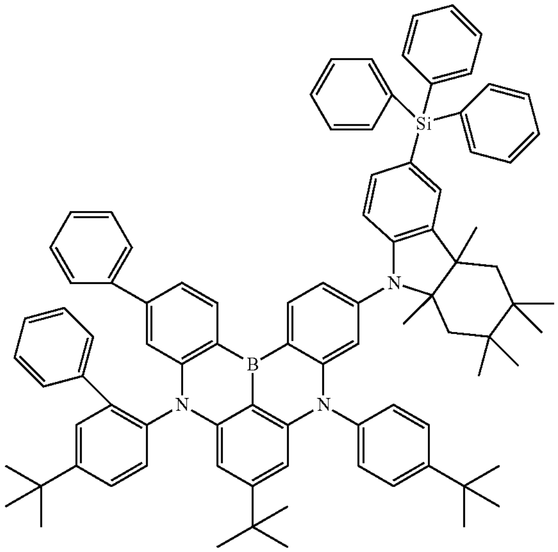

-continued
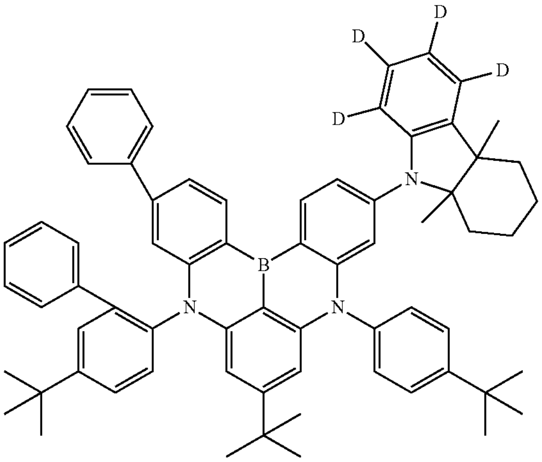
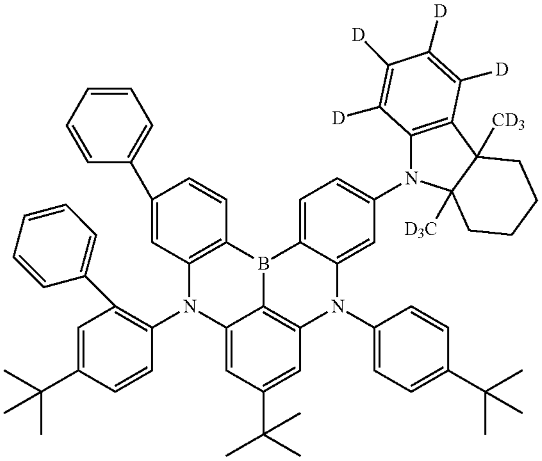
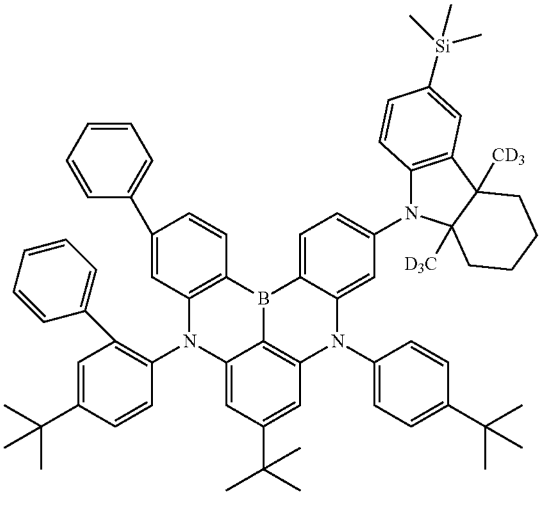
-continued
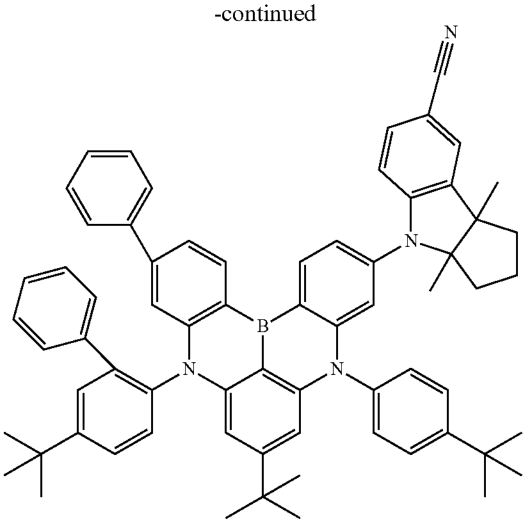
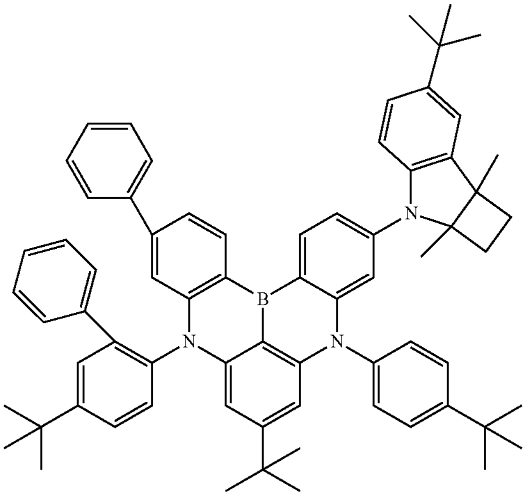
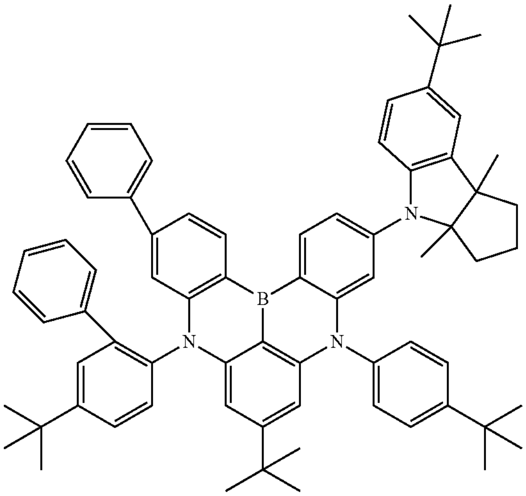

-continued
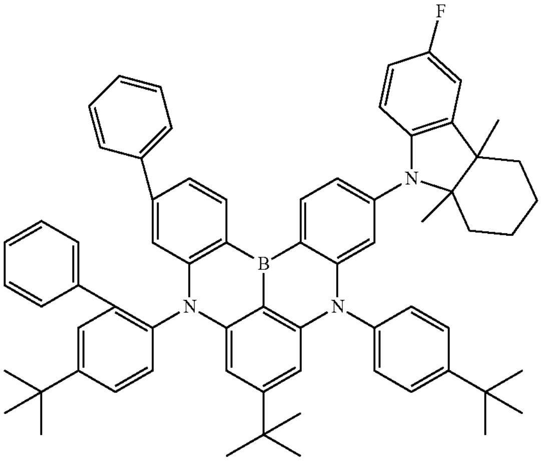
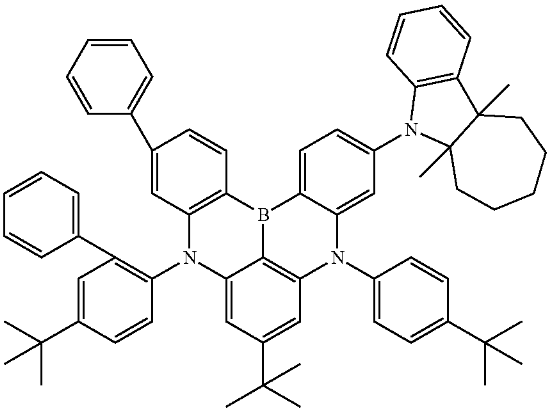
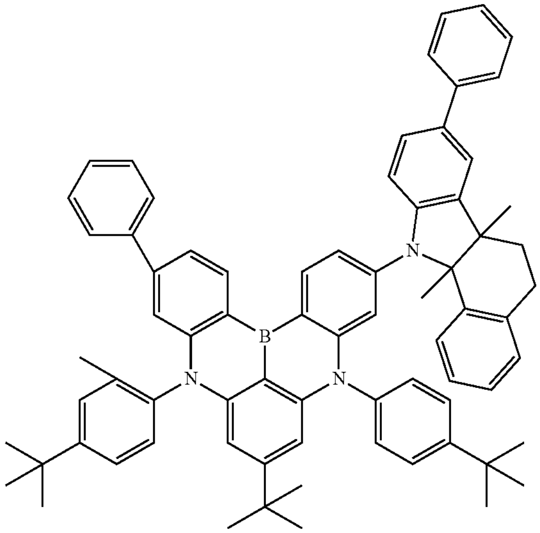
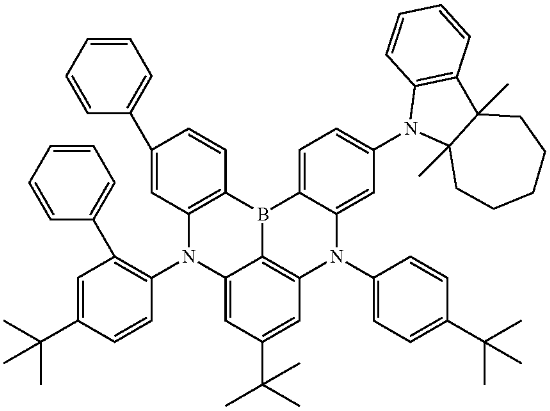
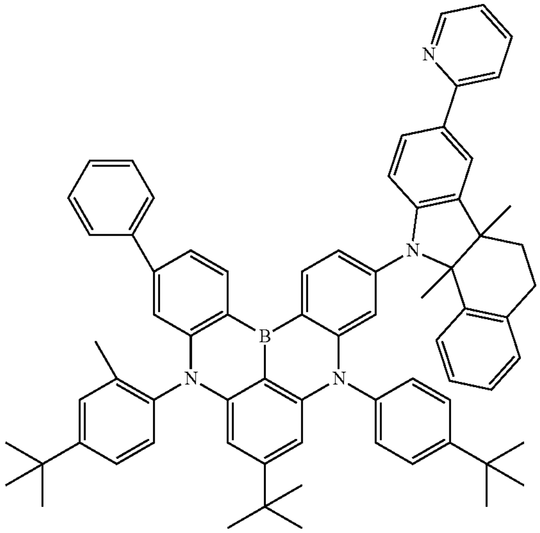
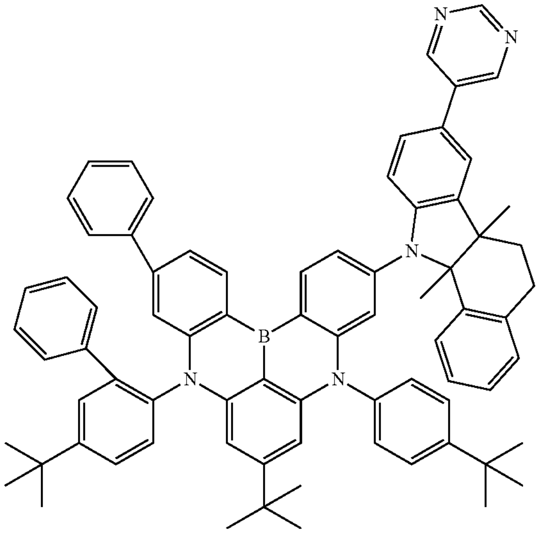
-continued -continued
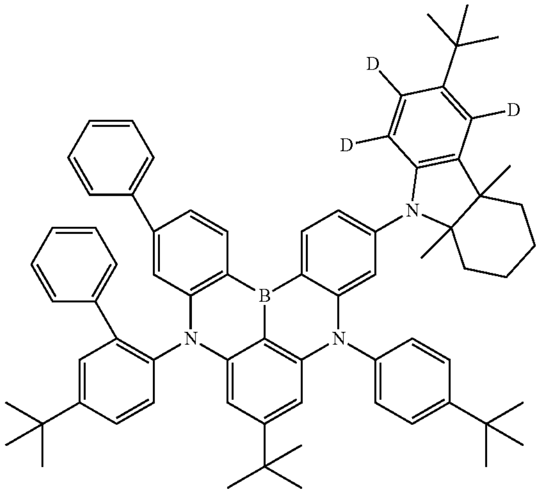
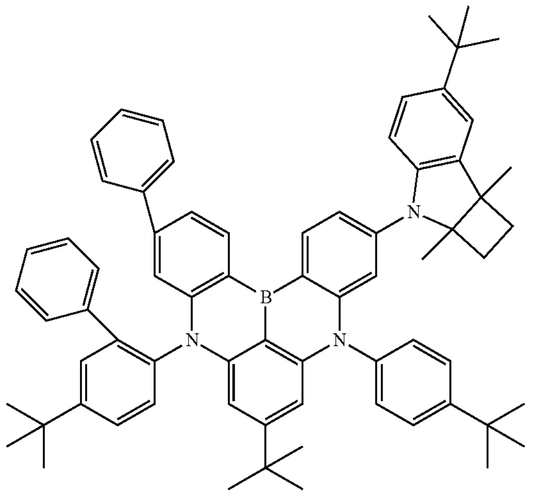
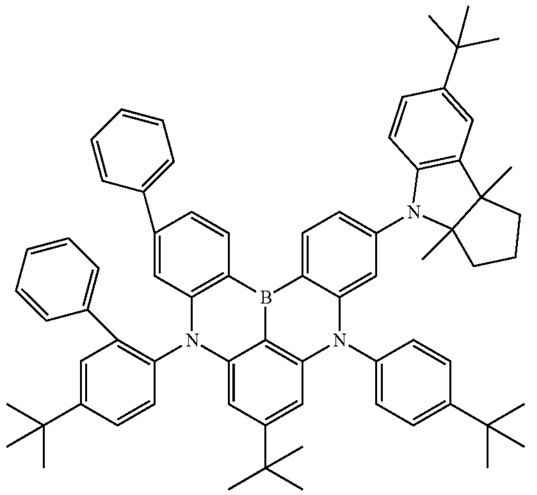
-continued
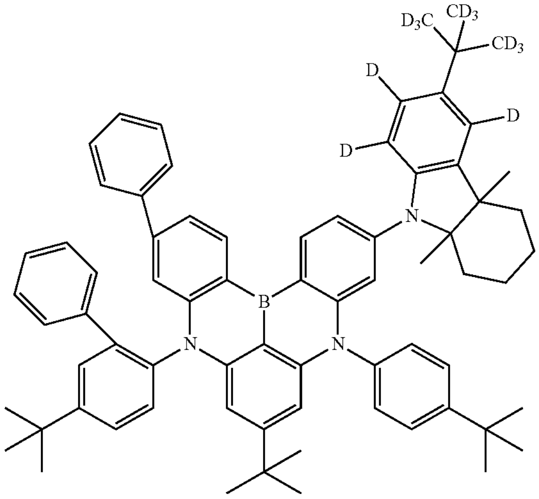
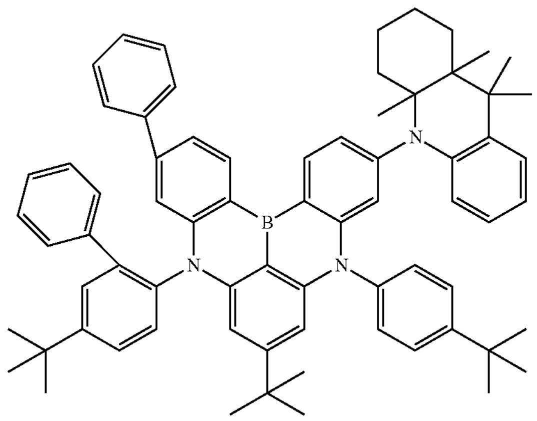
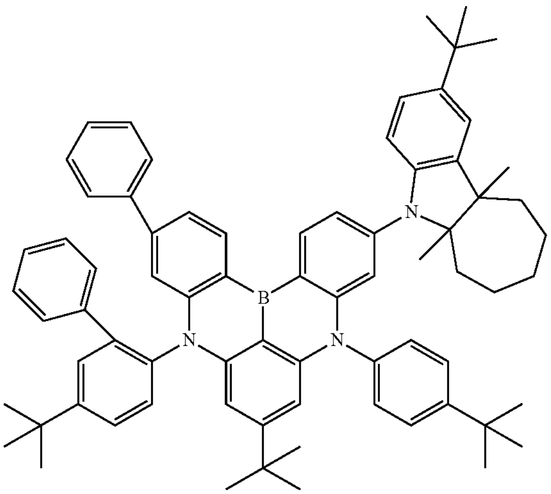

-continued
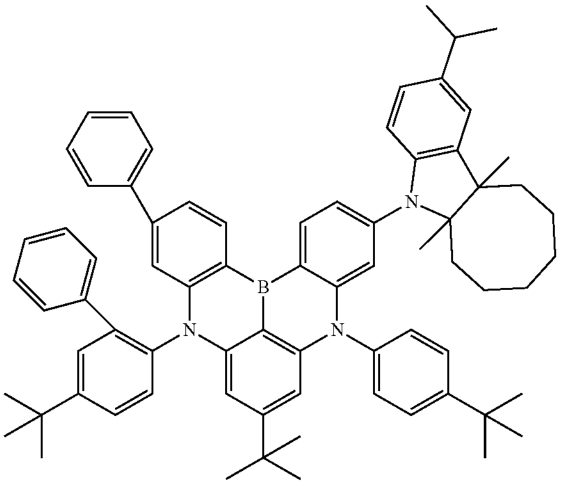
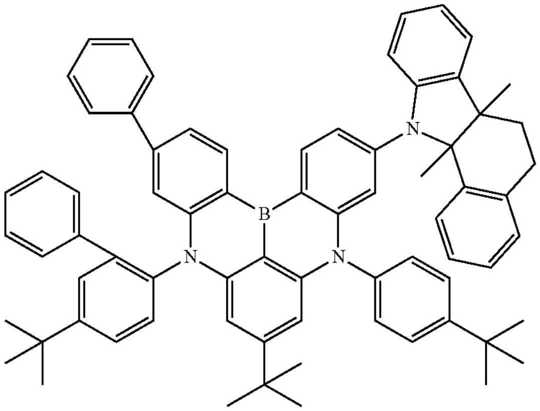
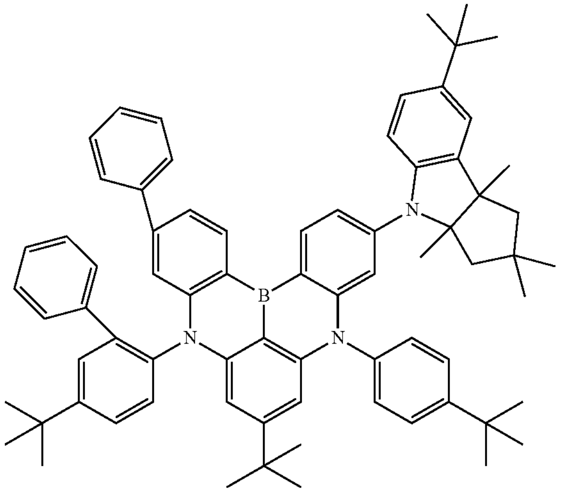
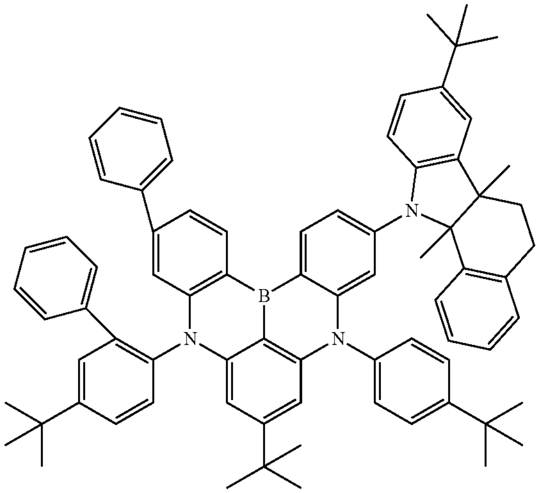
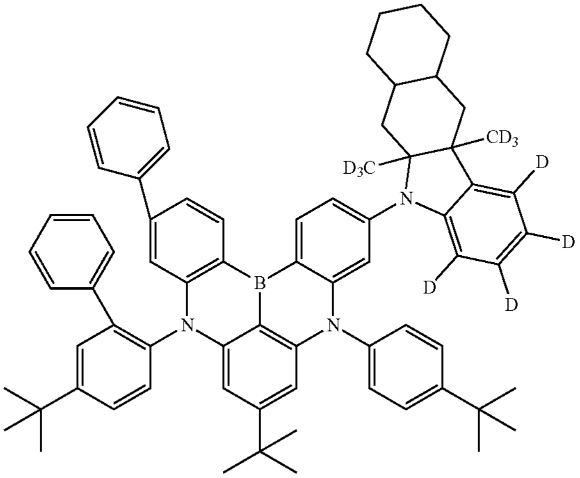
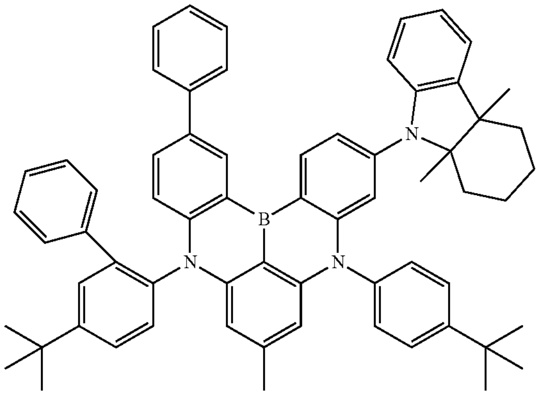
-continued -continued
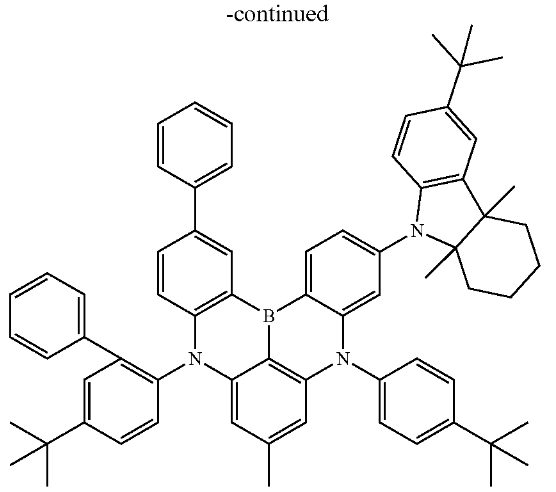
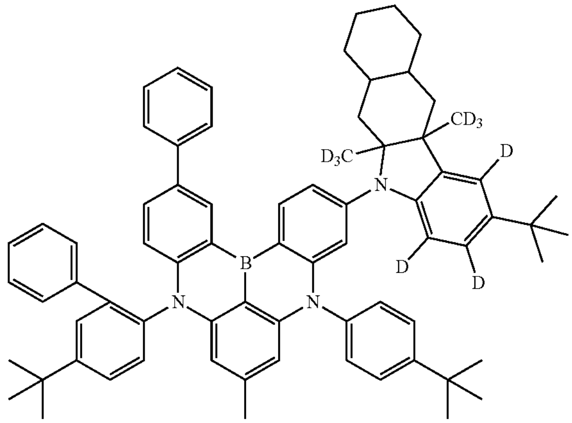
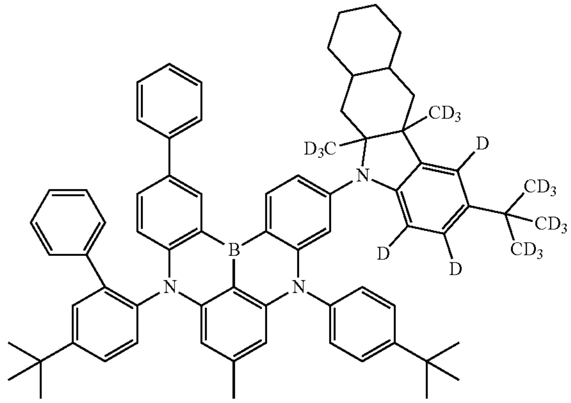
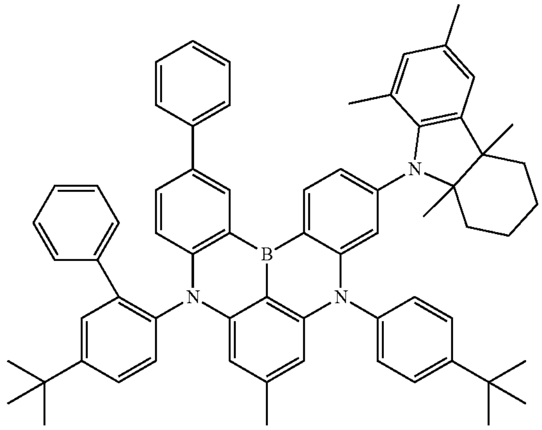
-continued
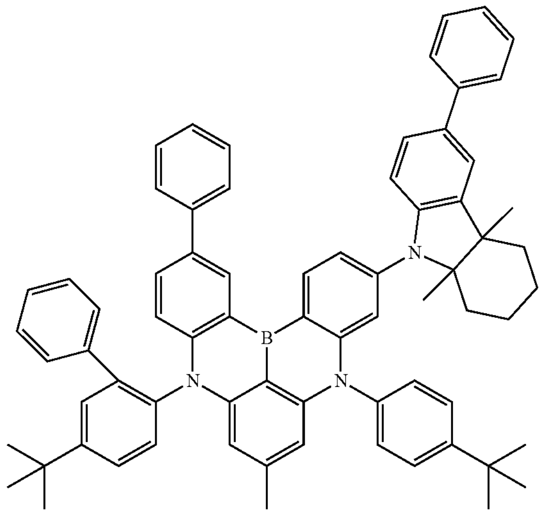
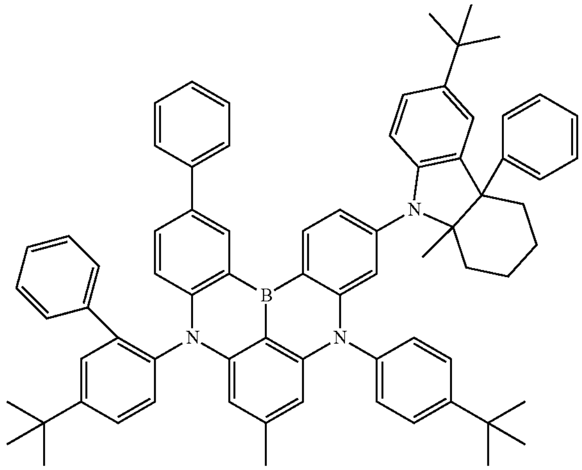
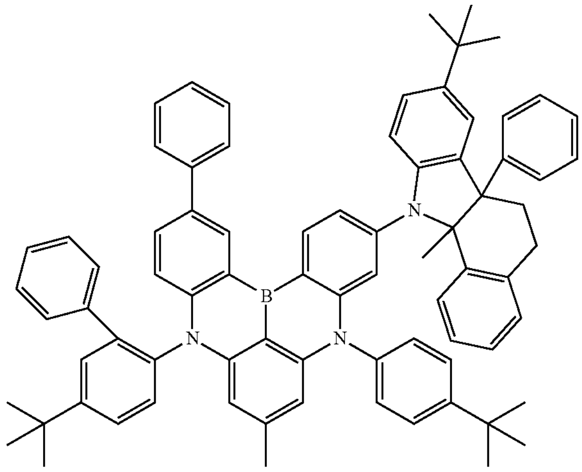

-continued
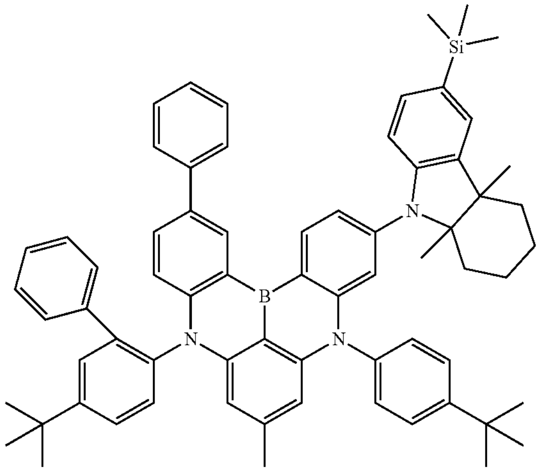
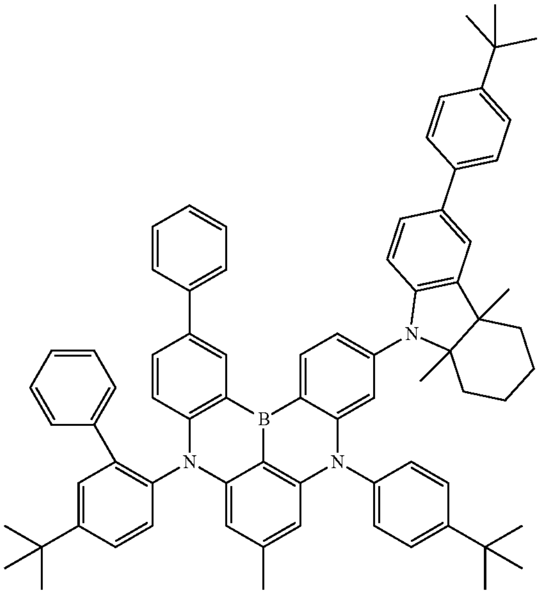
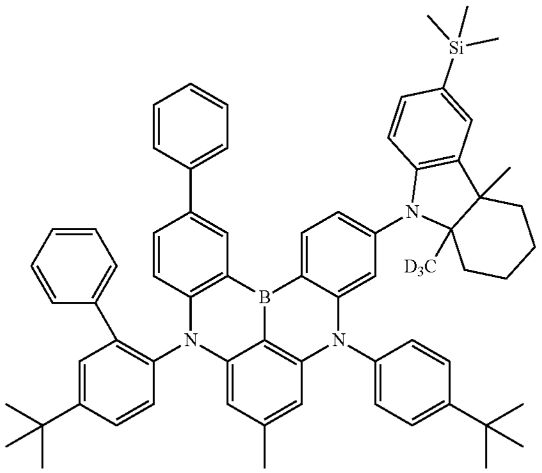
-continued
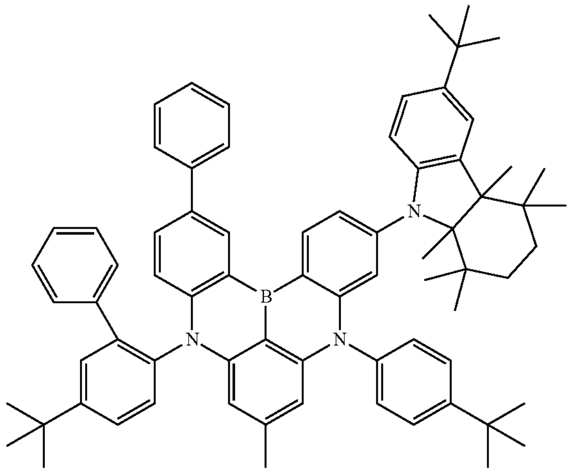
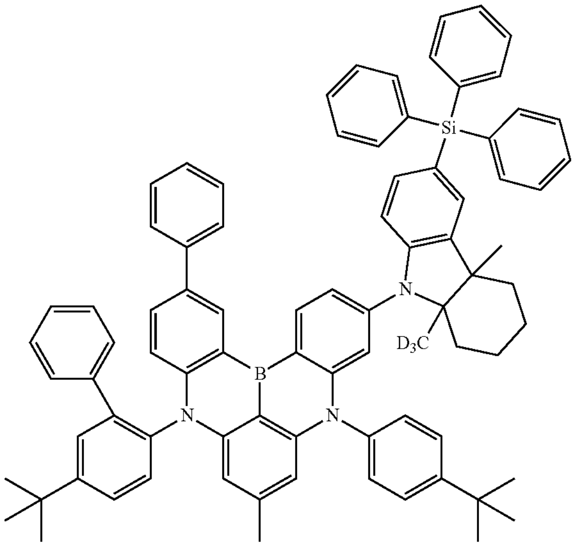
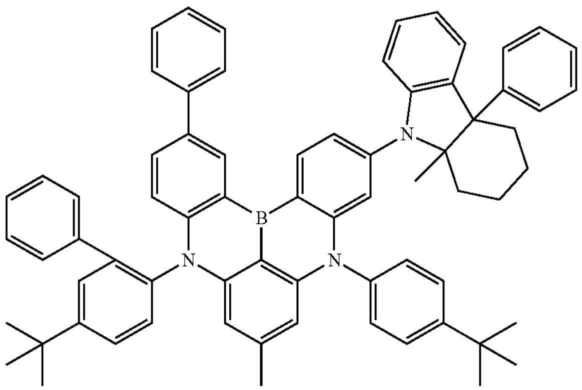

-continued
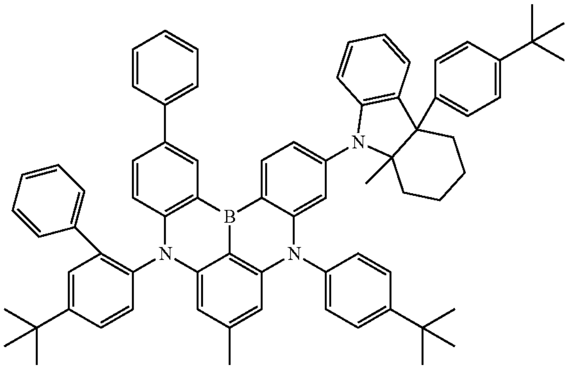 [SMILES: Cc1cc2c3c(c1)N(c1ccc(C(C)(C)C)cc1-c1ccccc1)c1ccc(-c4ccccc4)cc1B3c1ccc(N3c4ccccc4C4(c5ccc(C(C)(C)C)cc5)CCCCC34C)cc1N2c1ccc(C(C)(C)C)cc1]
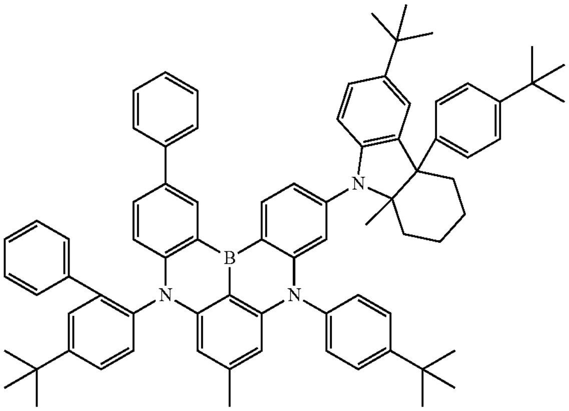
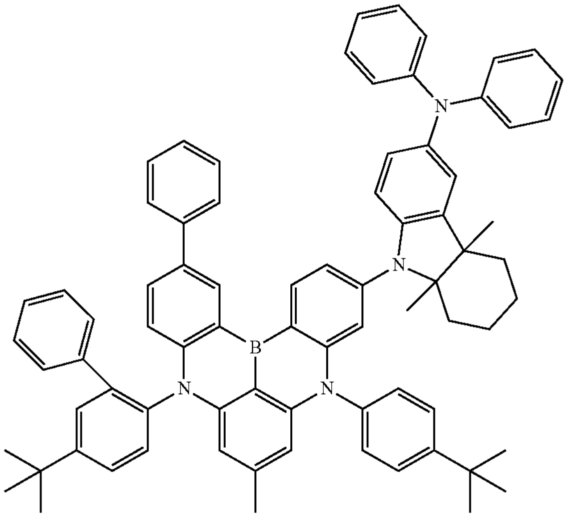
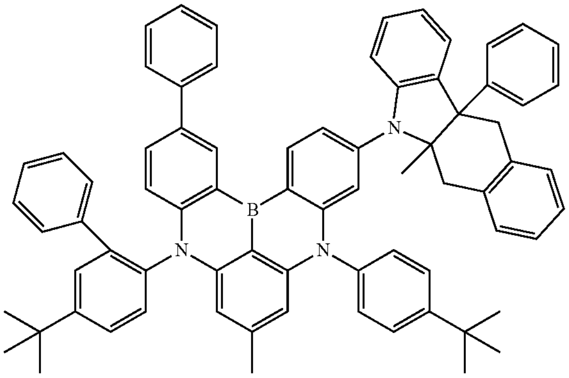
-continued
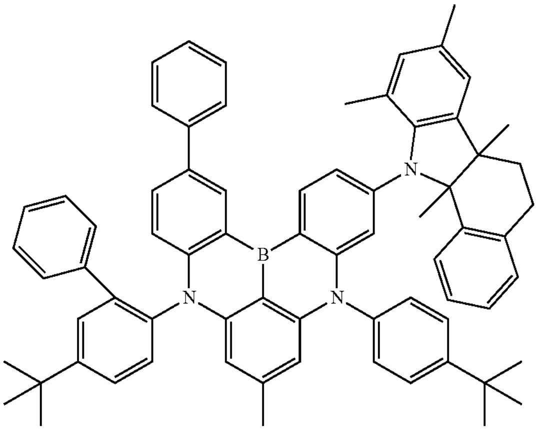
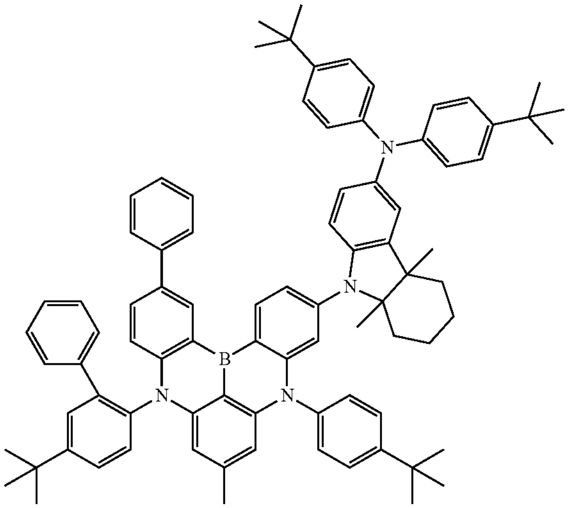
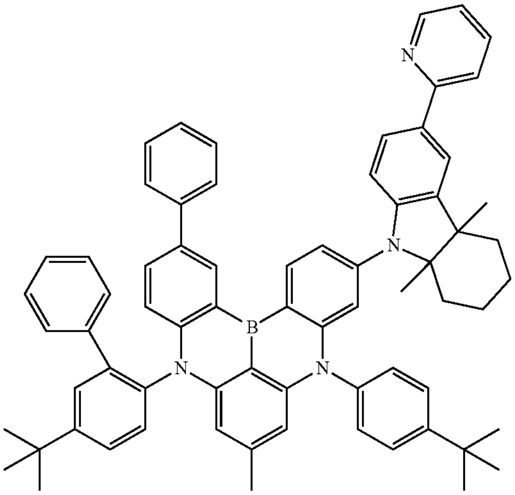

-continued
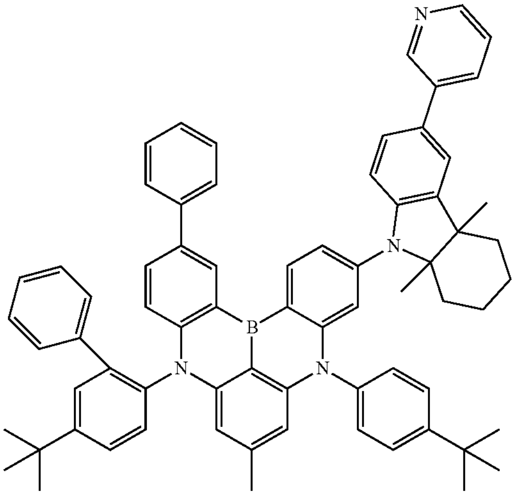
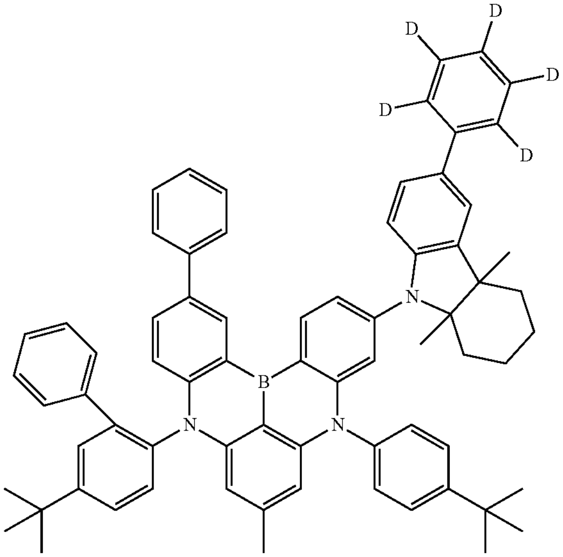
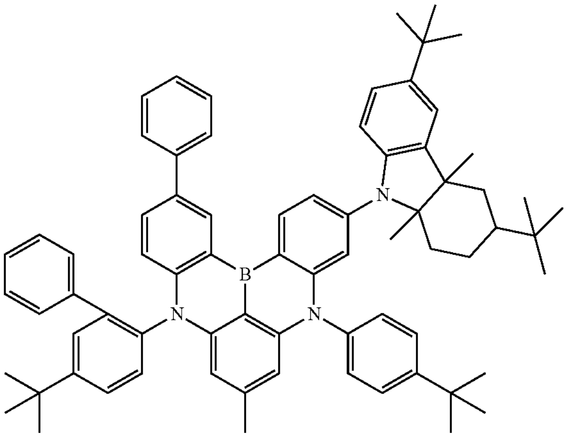
-continued
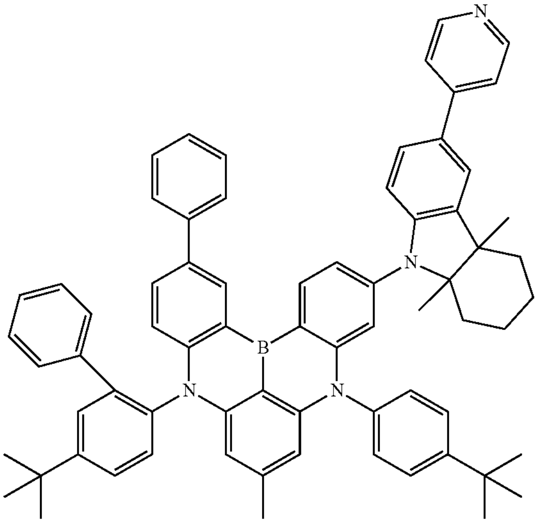
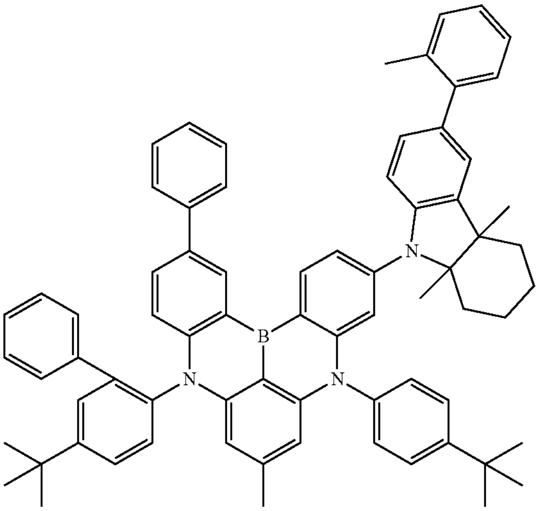
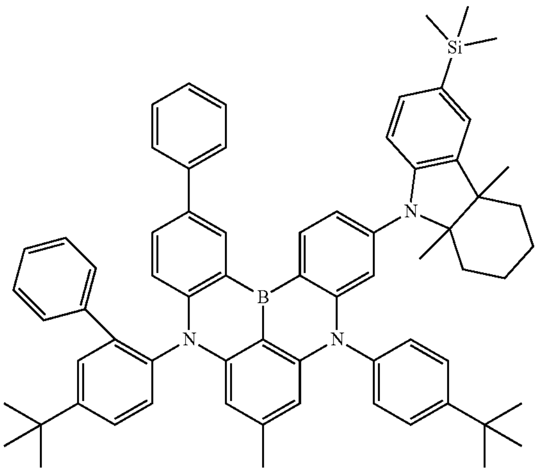

-continued
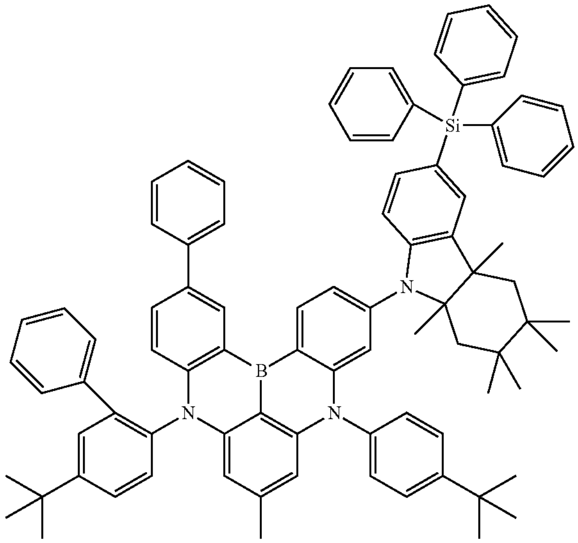
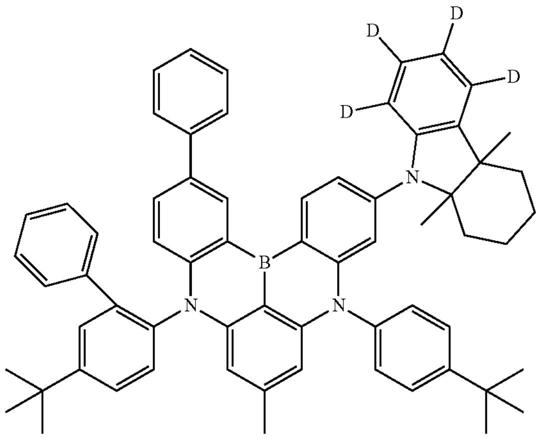
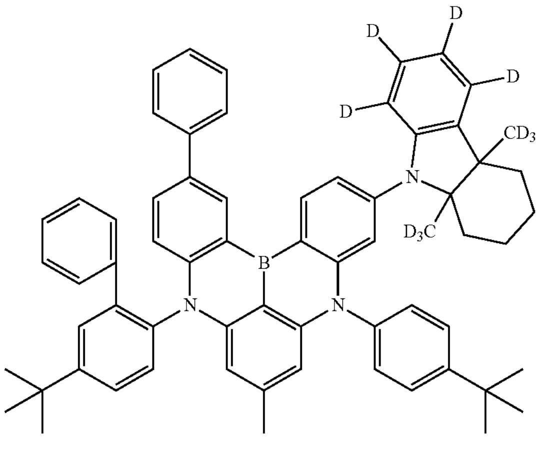
-continued
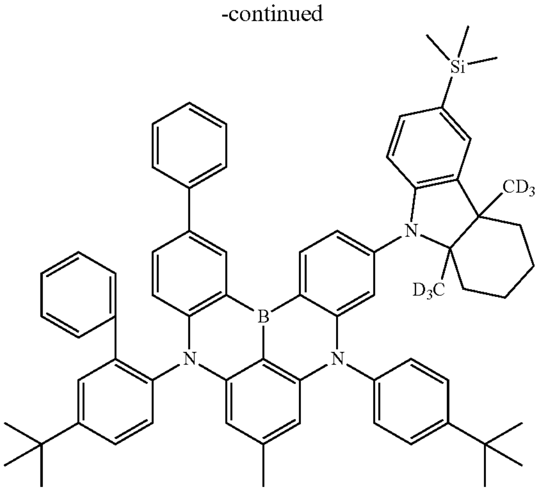
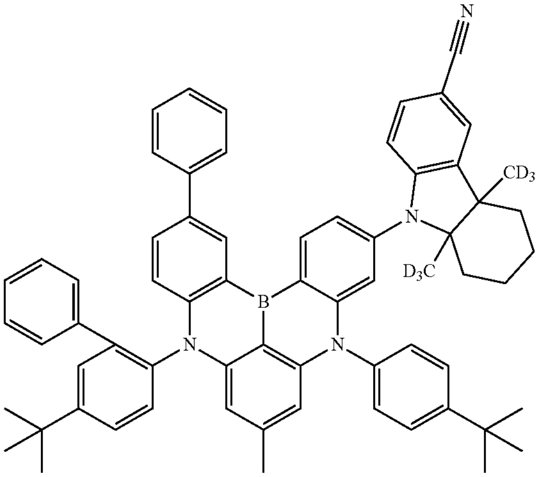
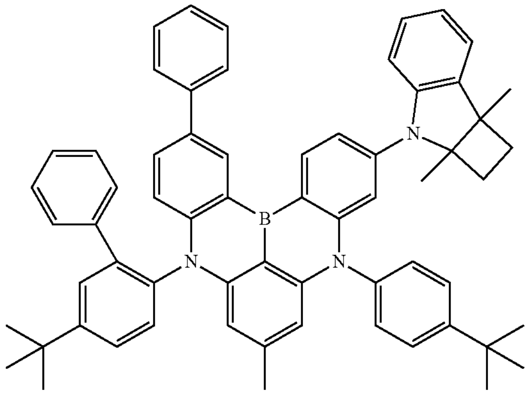
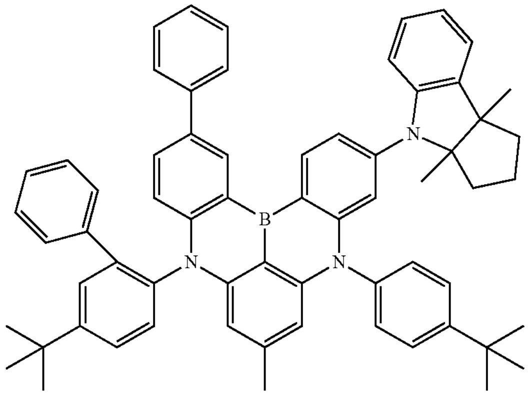

-continued
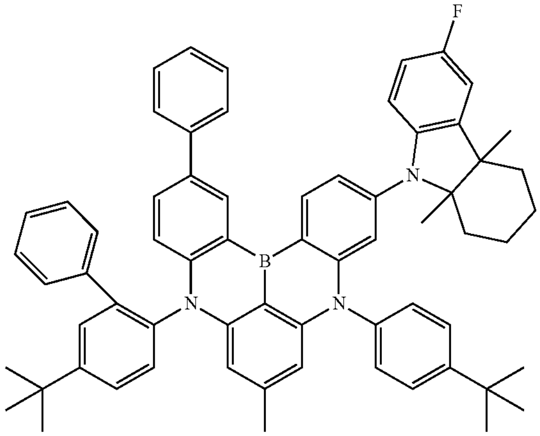
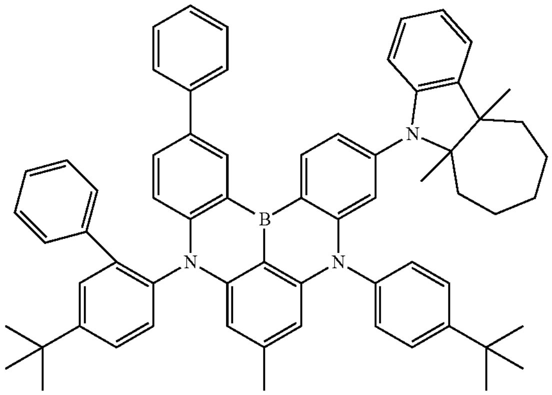
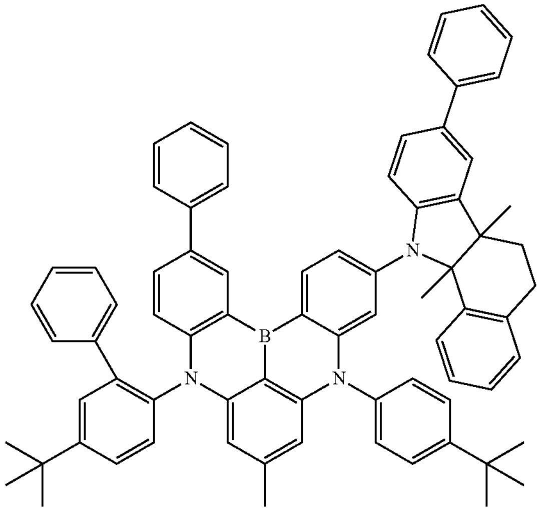
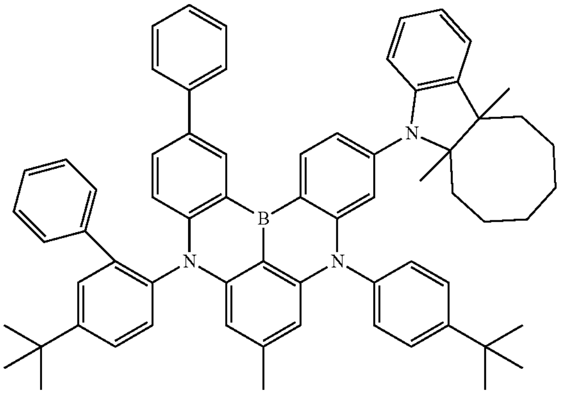
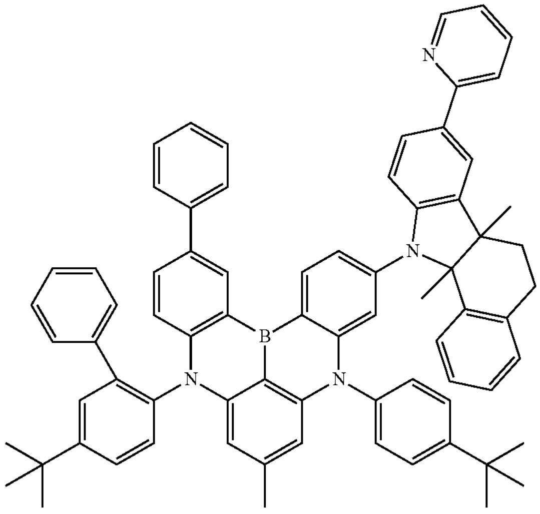
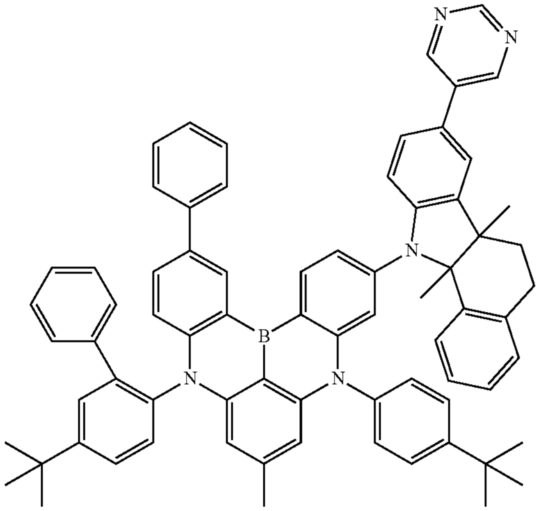
-continued -continued
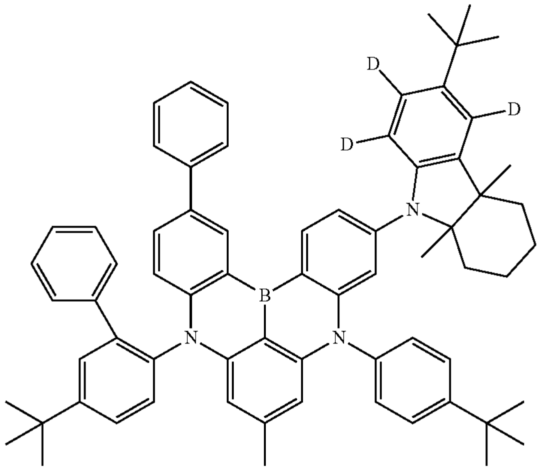
-continued
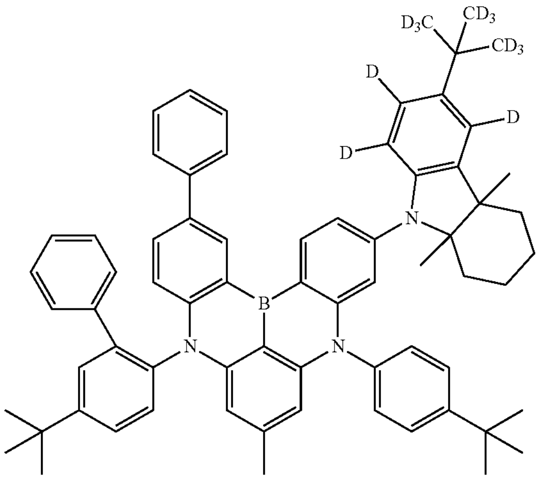
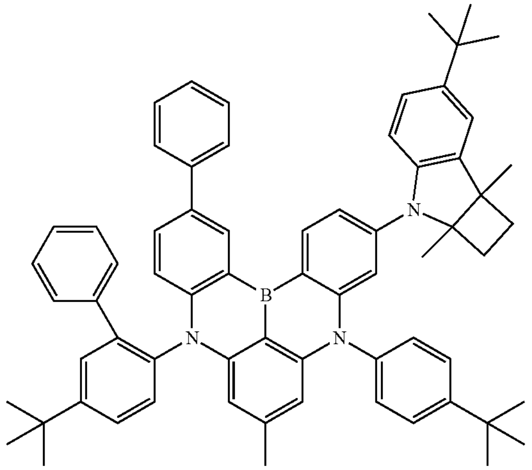
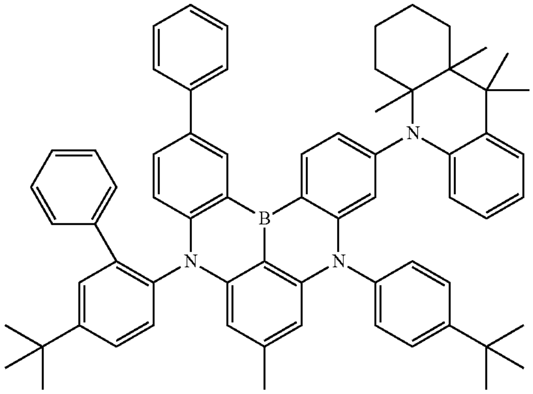
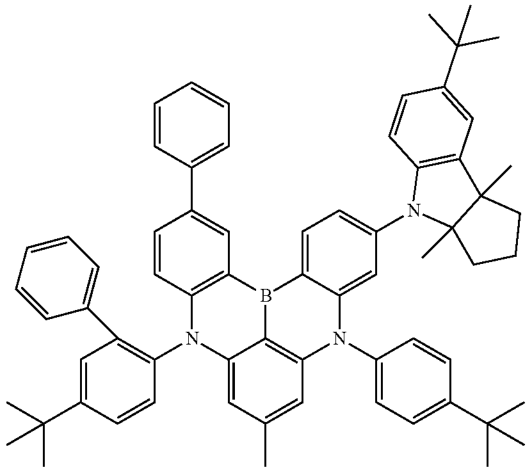
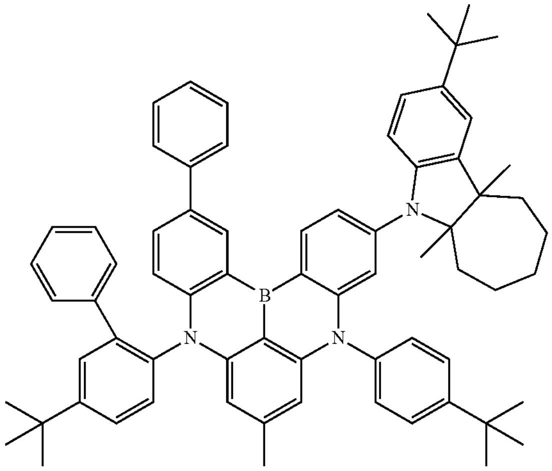

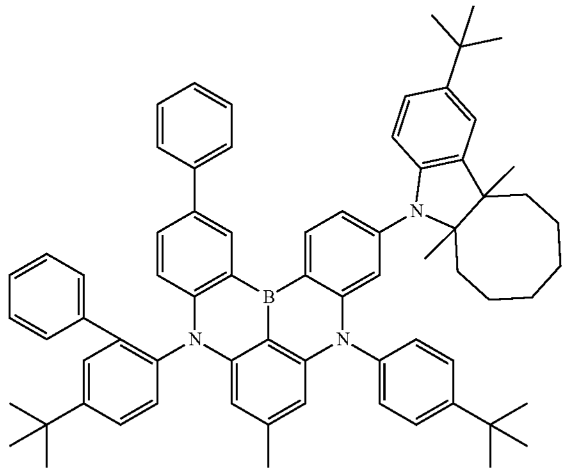
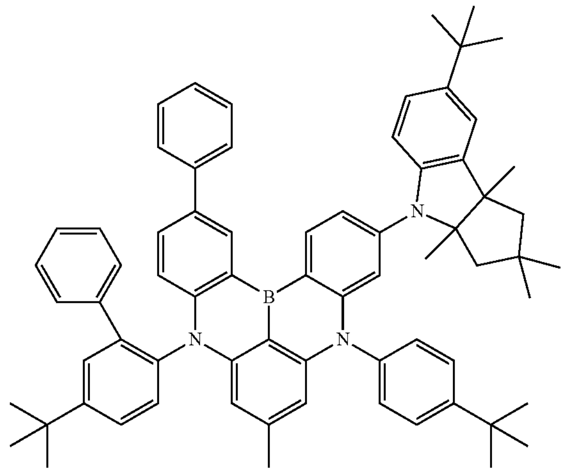
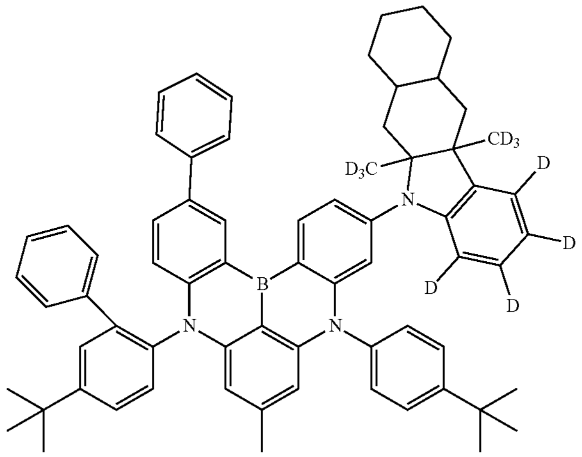
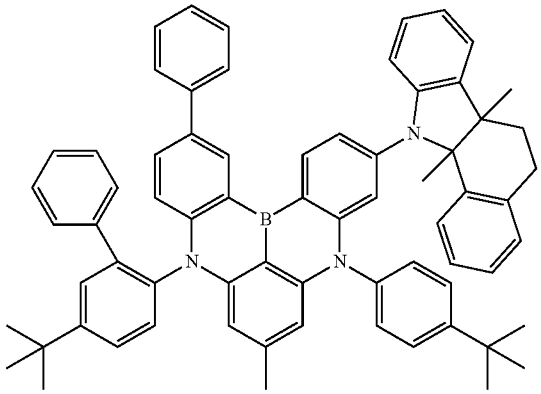
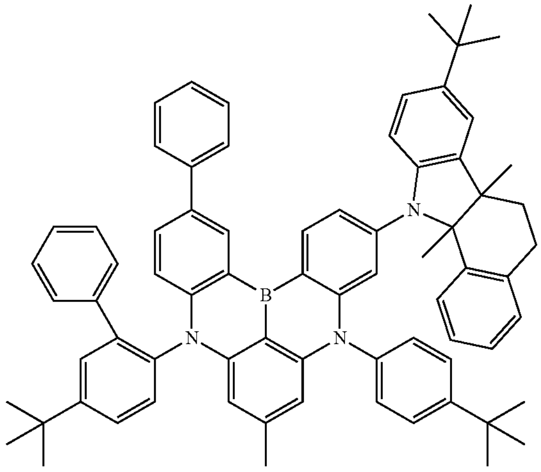
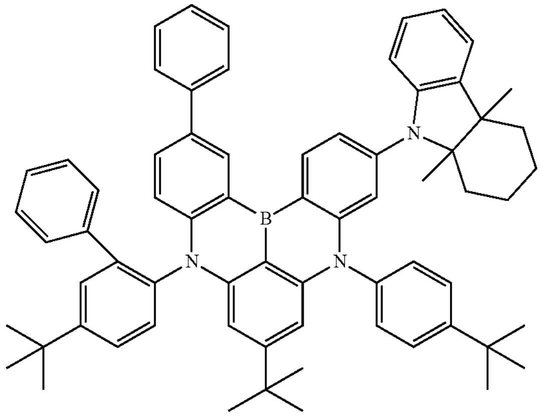

-continued
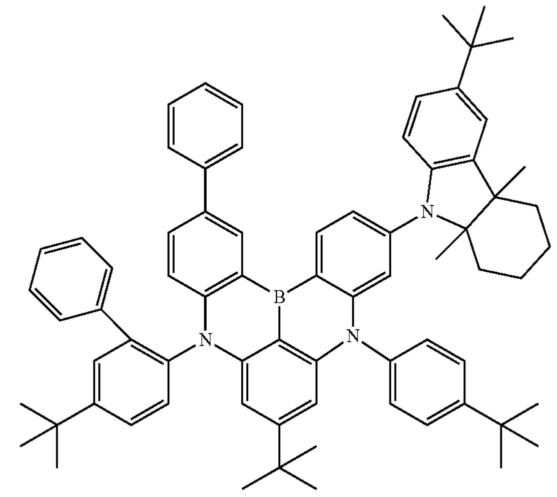
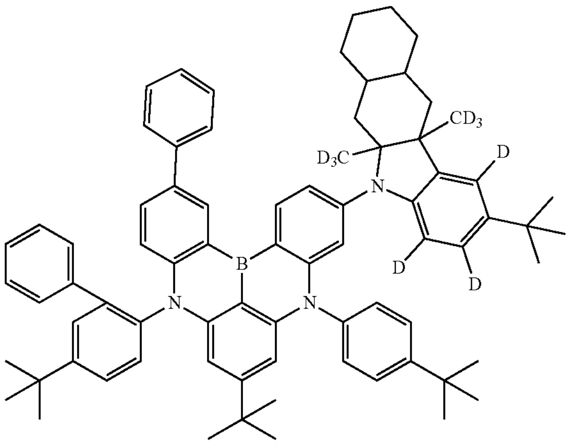
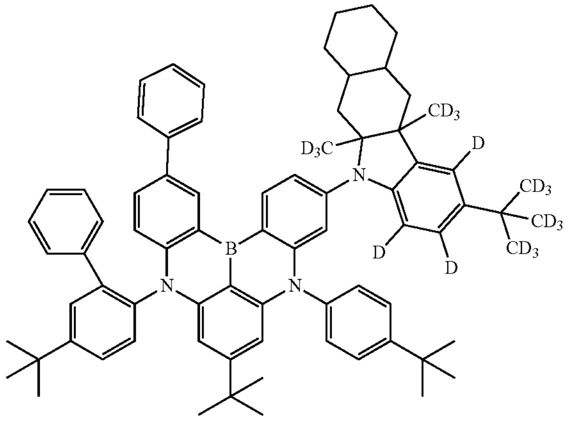
-continued
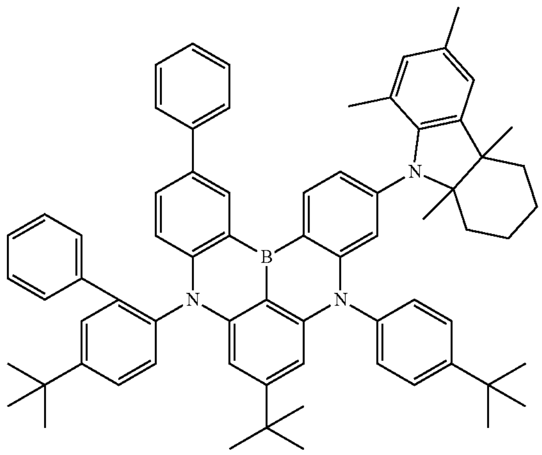
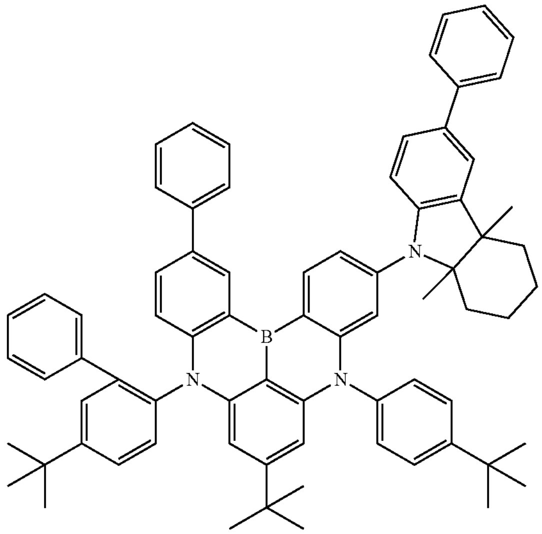
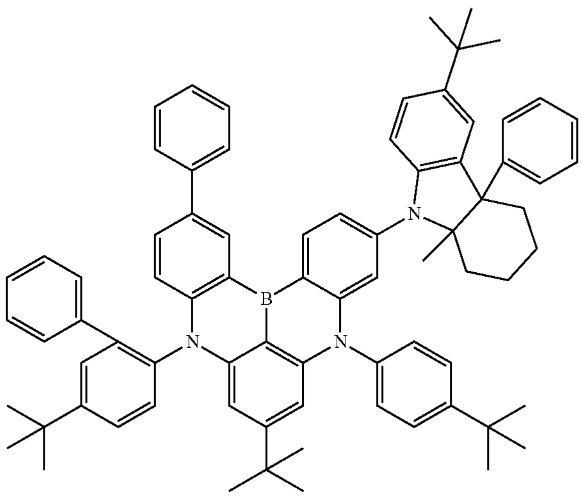

-continued
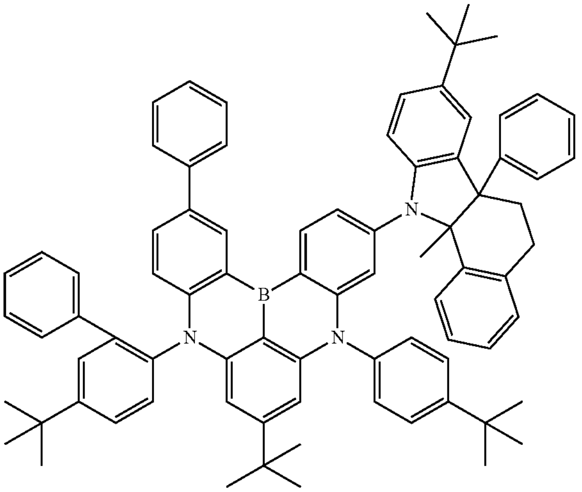
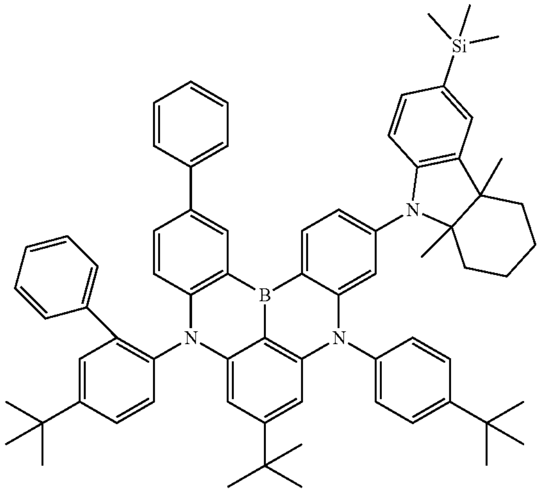
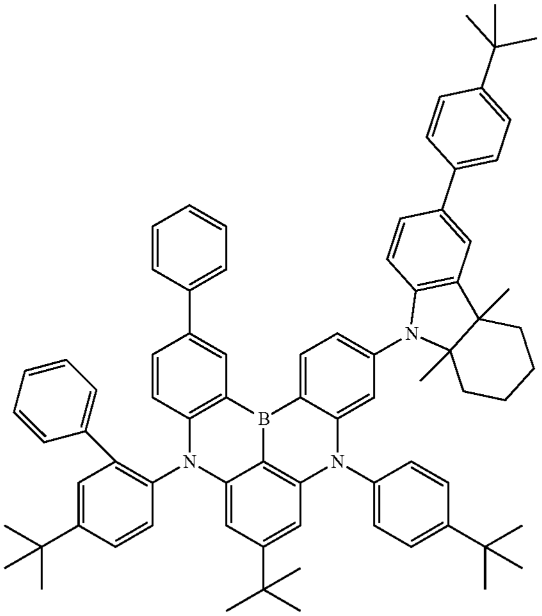
-continued
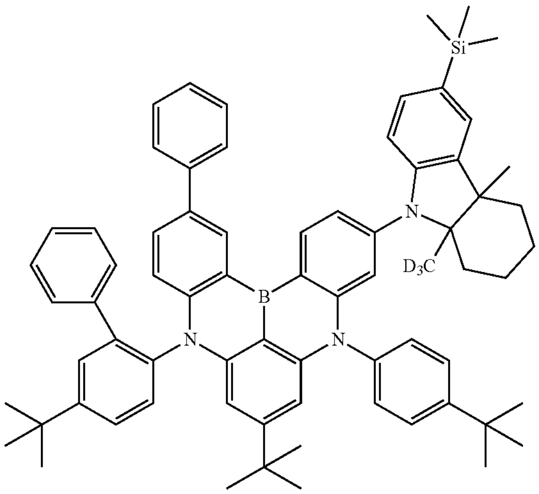
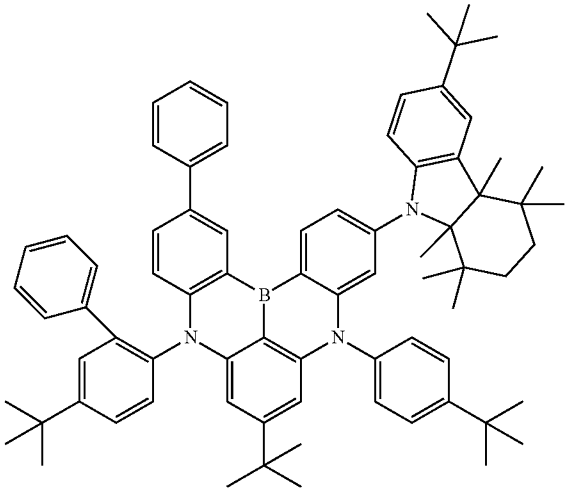
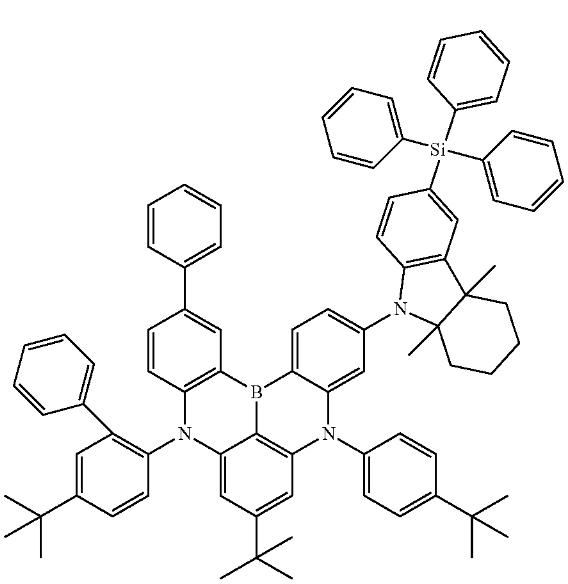

-continued
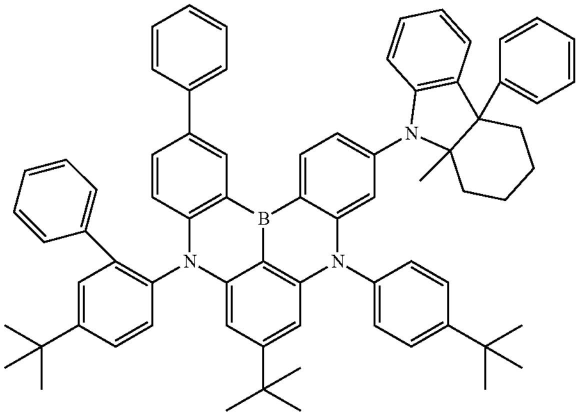
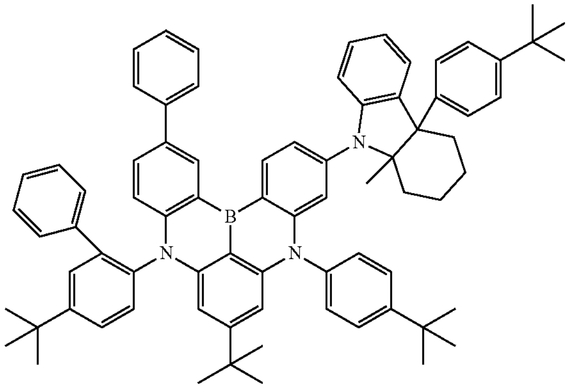
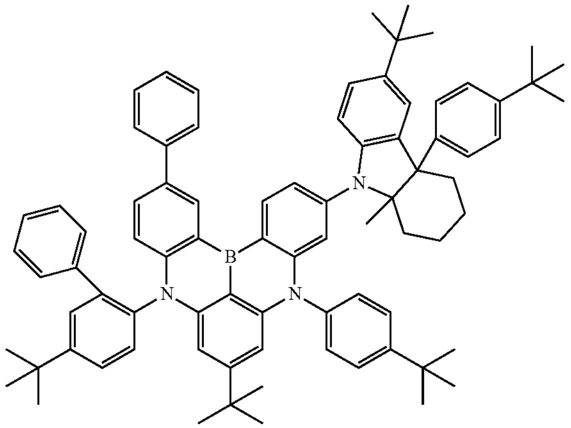
-continued
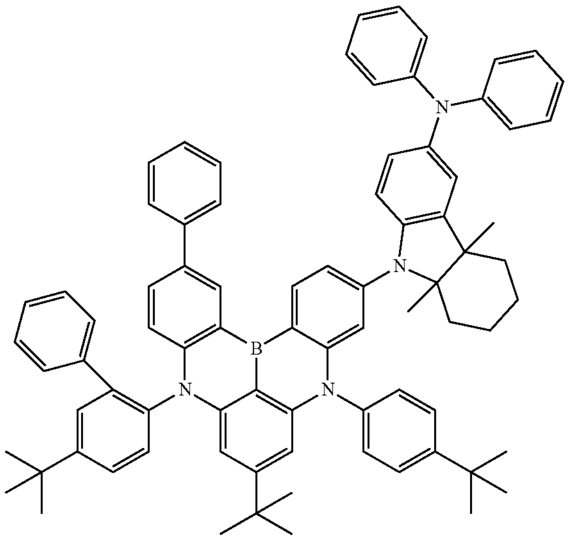
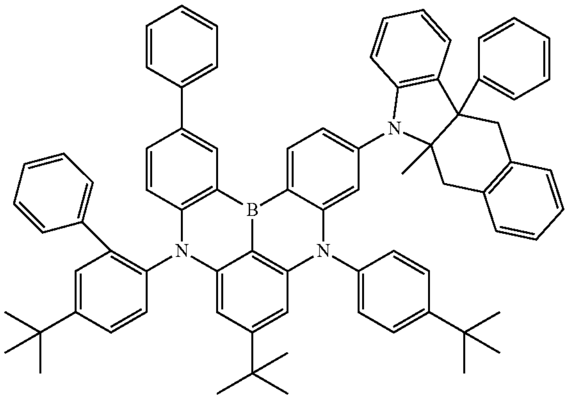
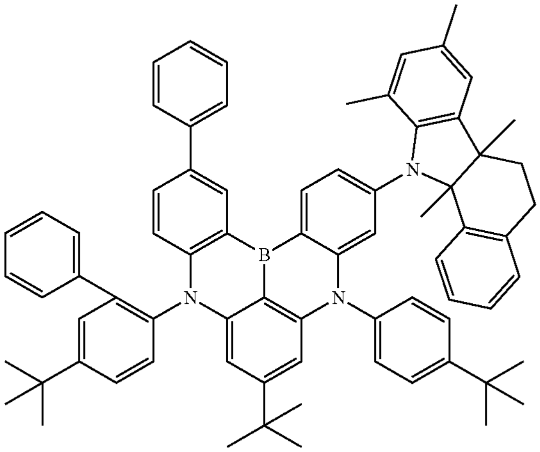

-continued
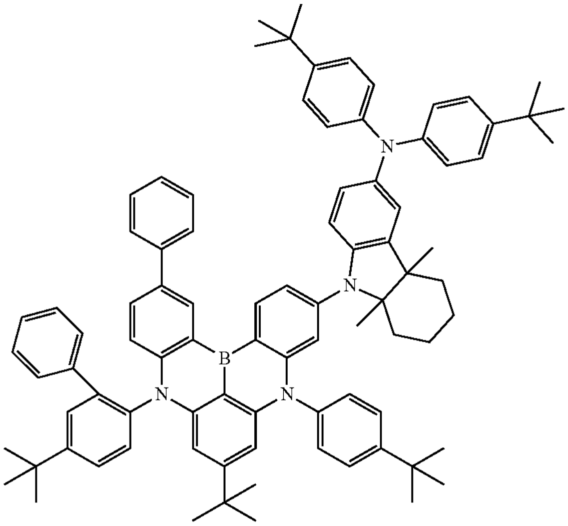
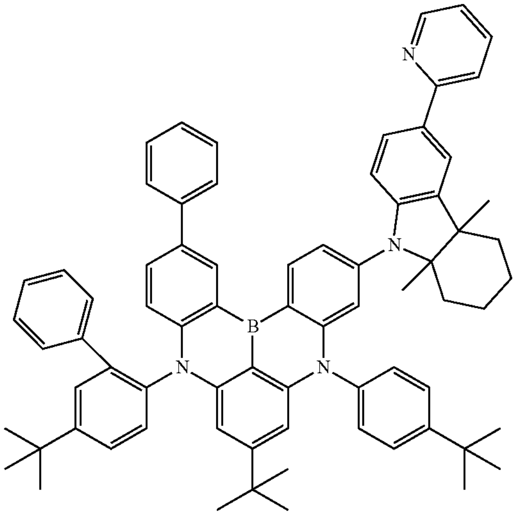
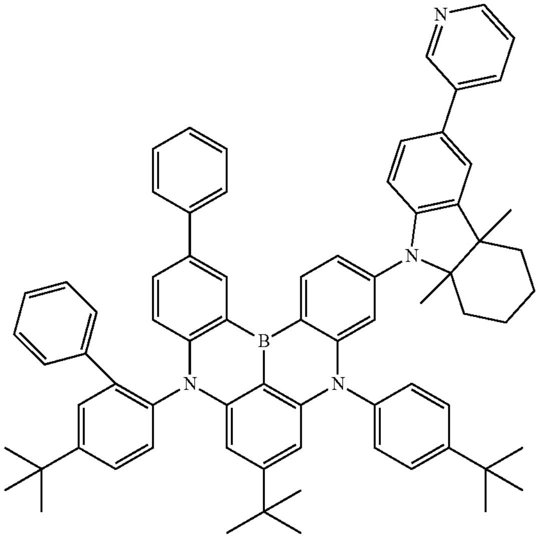
-continued
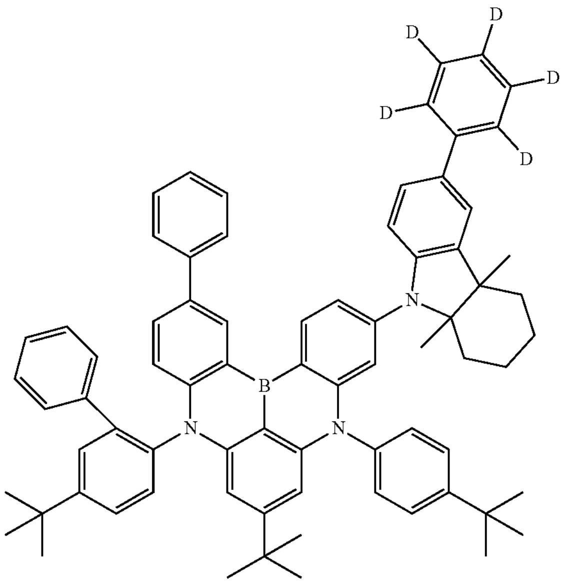
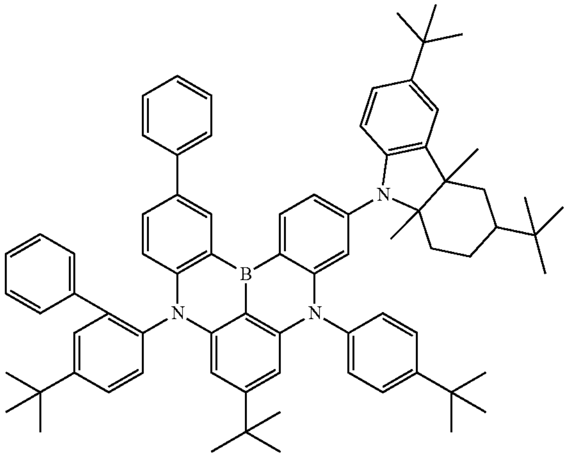
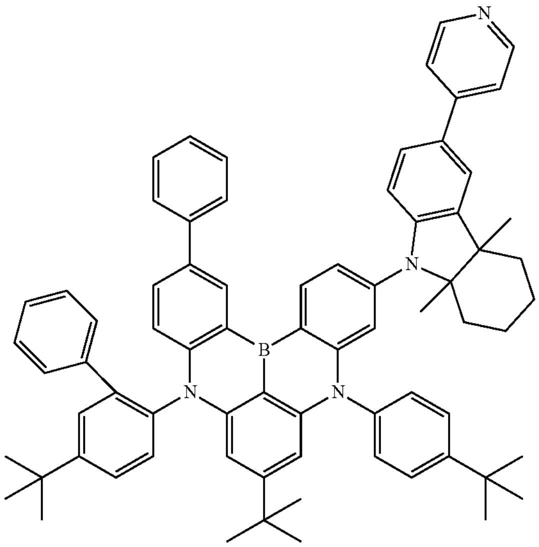

-continued
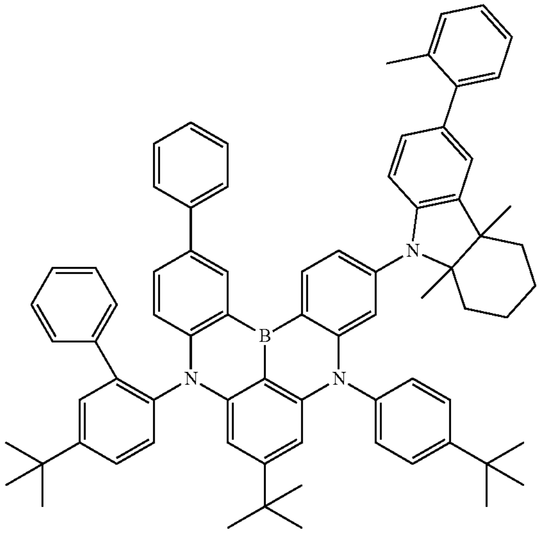
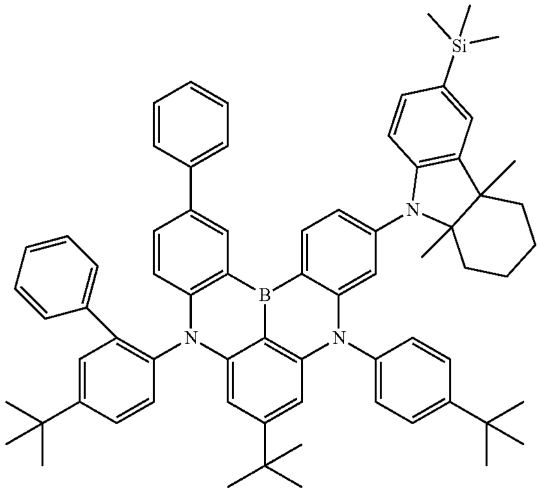
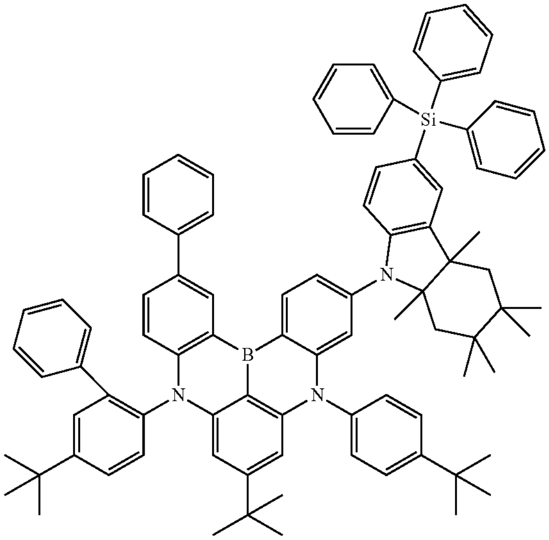
-continued
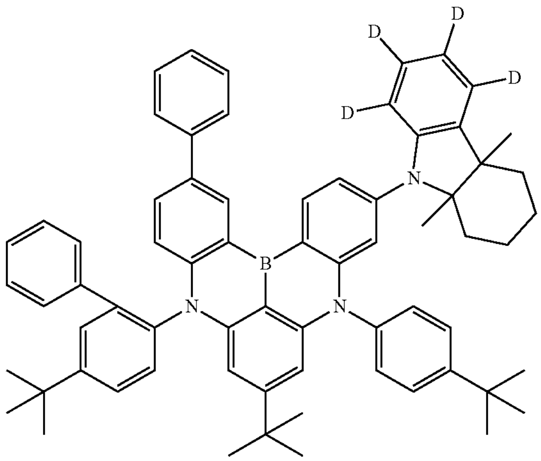
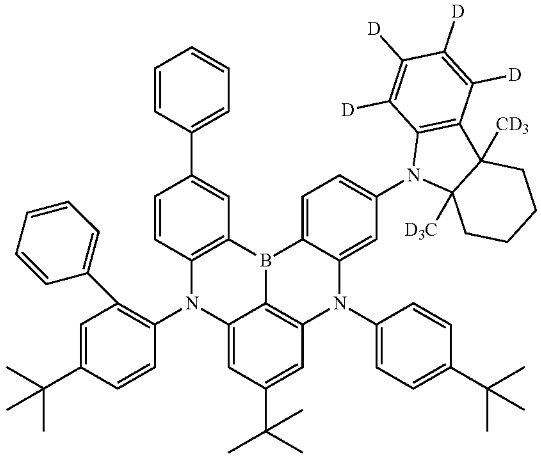
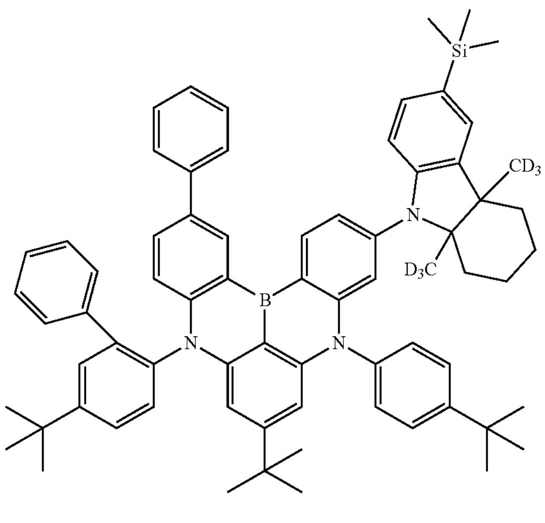

-continued
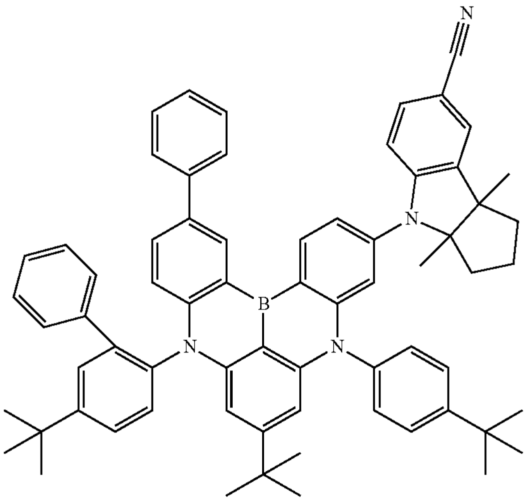
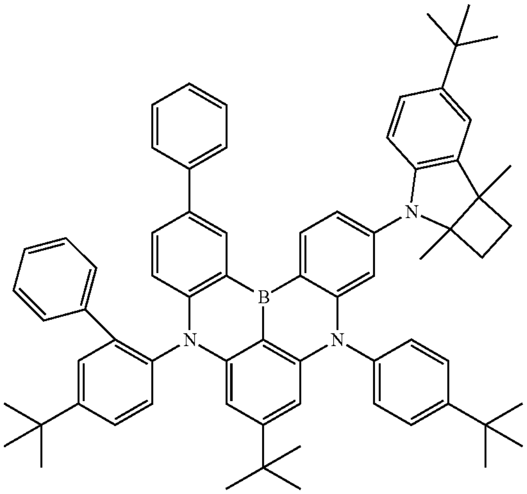
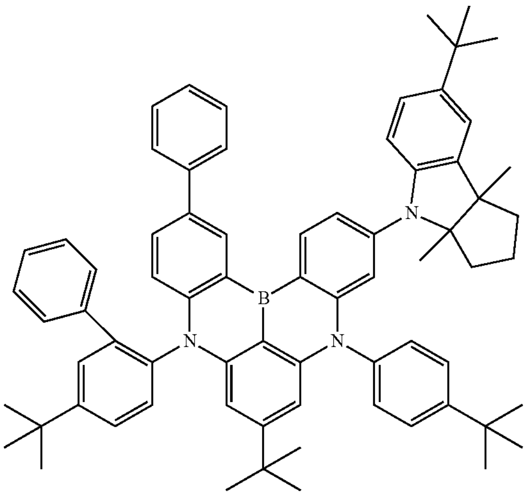
-continued
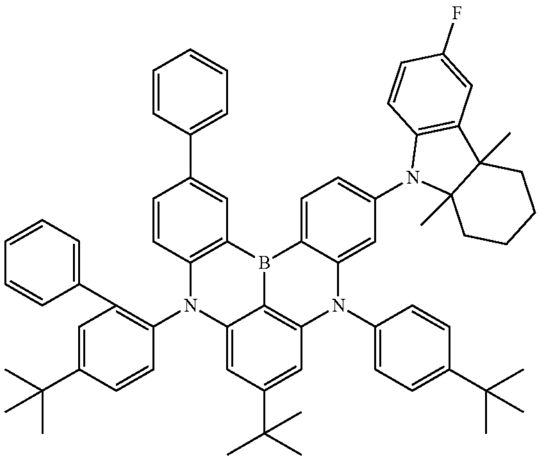
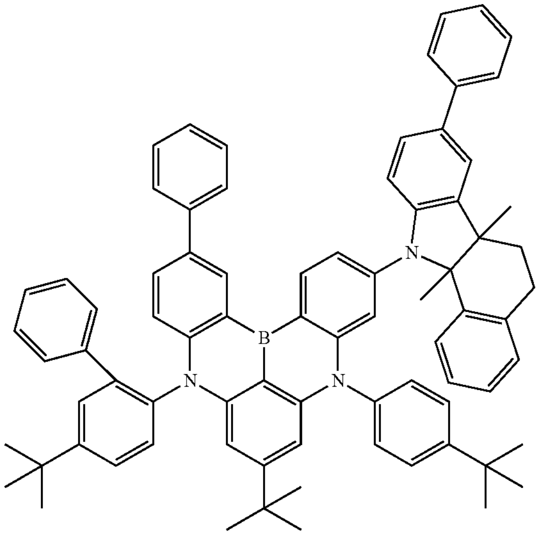
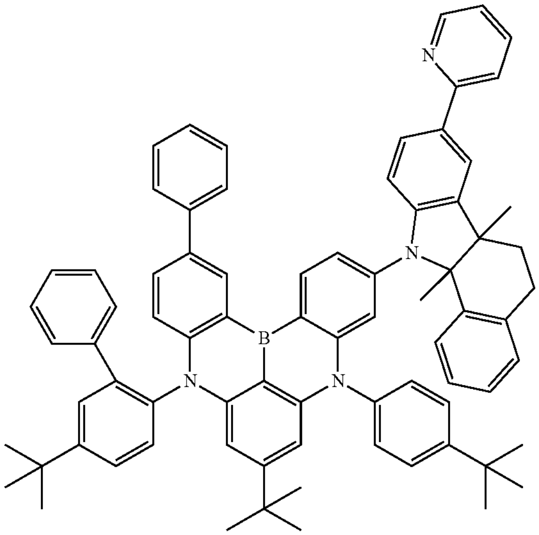

-continued
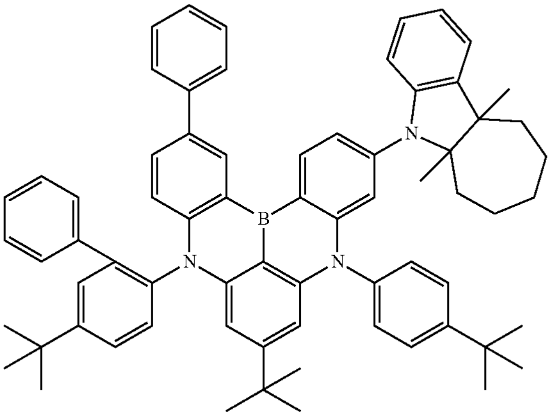
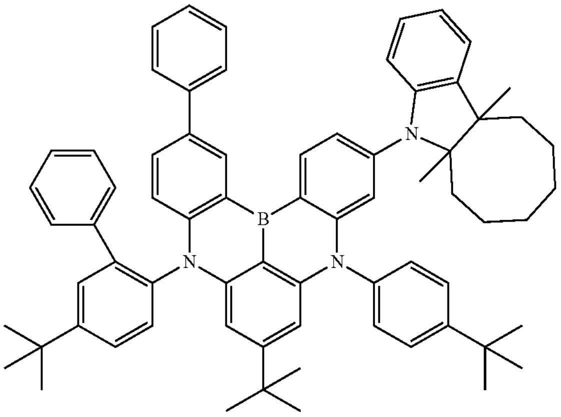
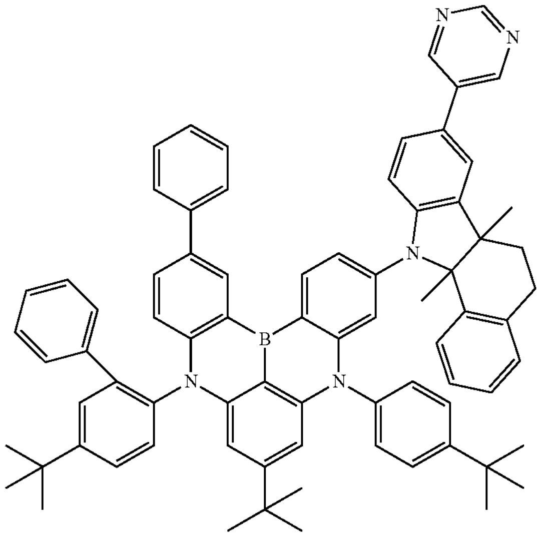
-continued
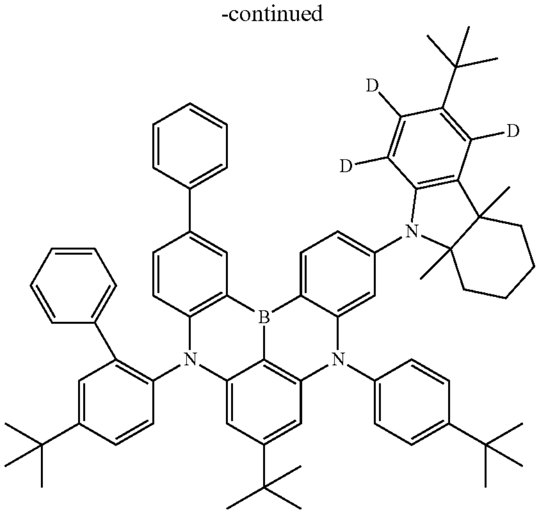
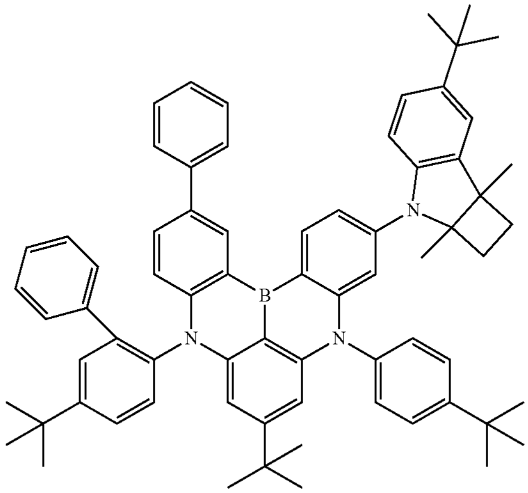
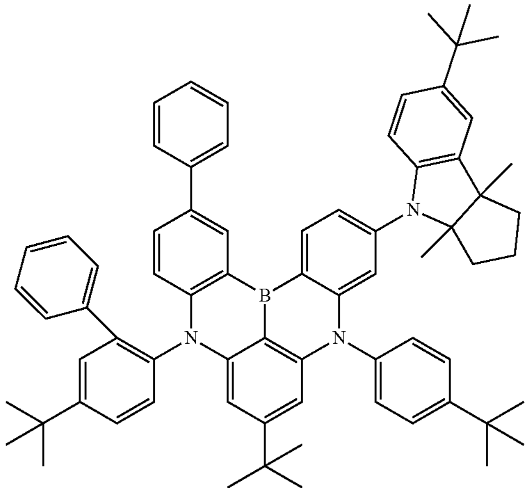

-continued
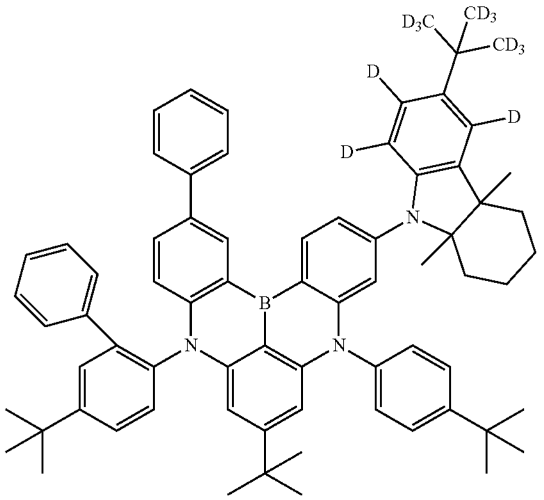
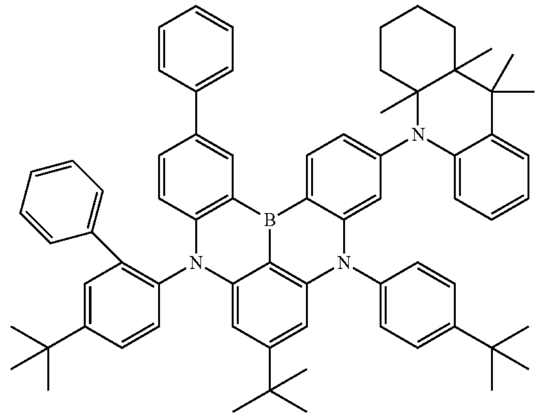
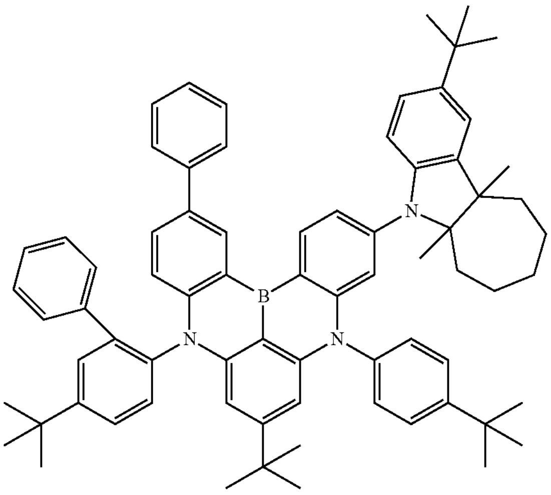
-continued
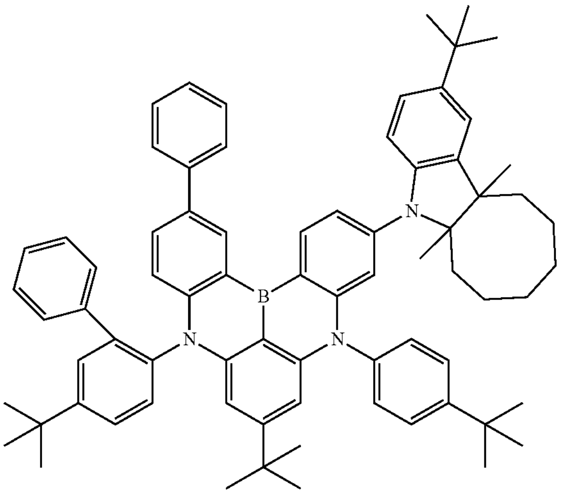
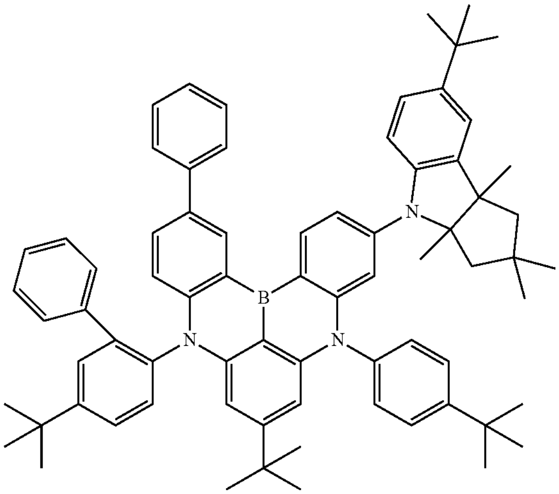
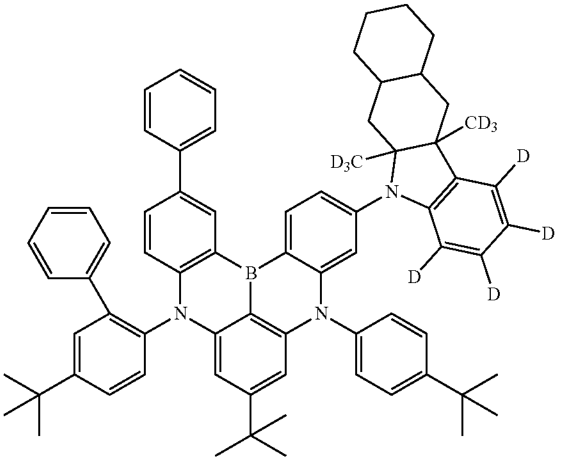

-continued
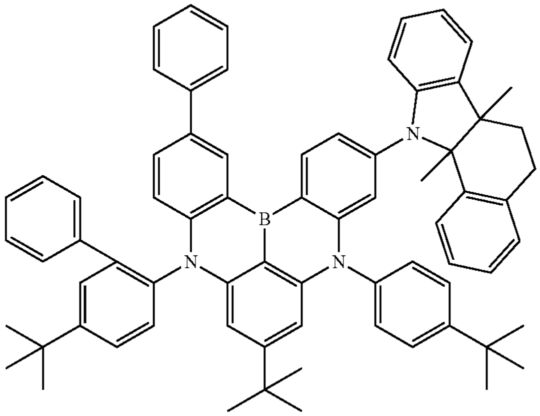
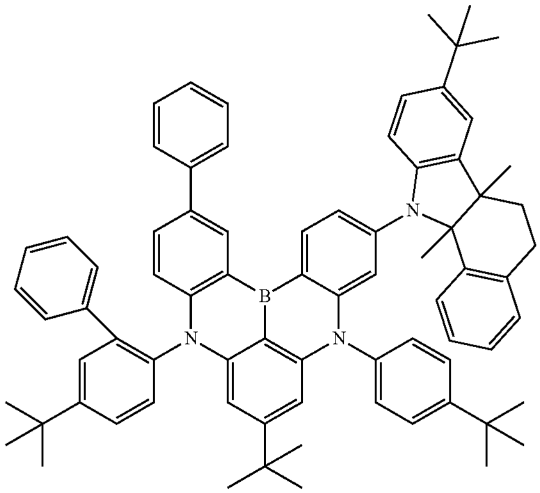
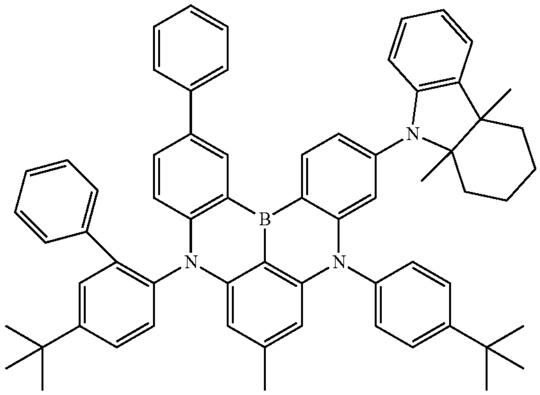
-continued
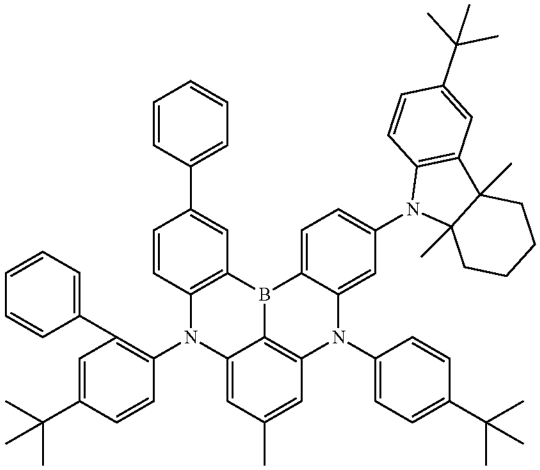
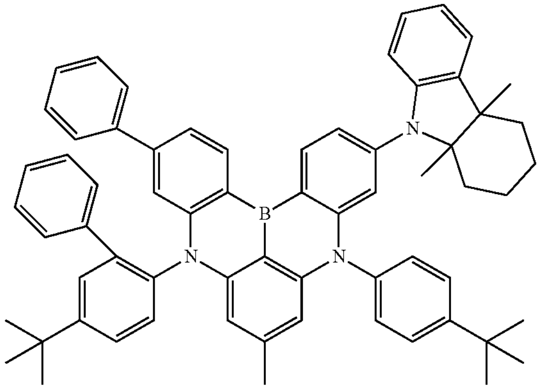
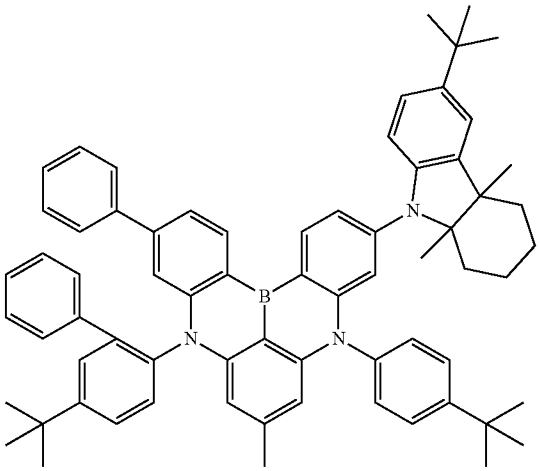
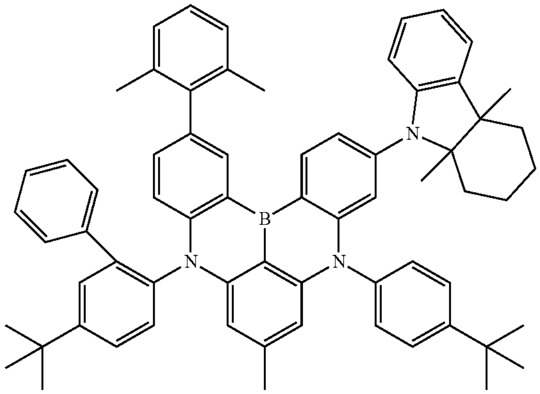

-continued
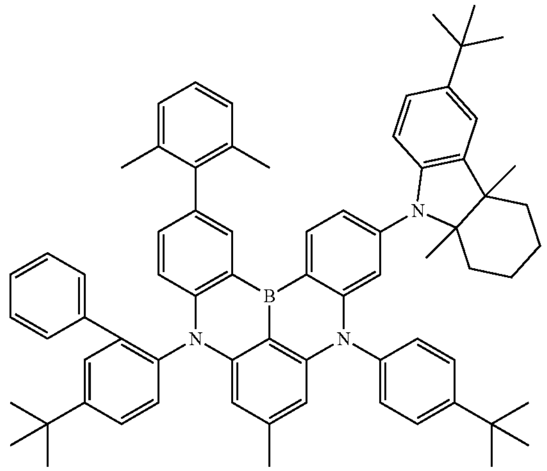
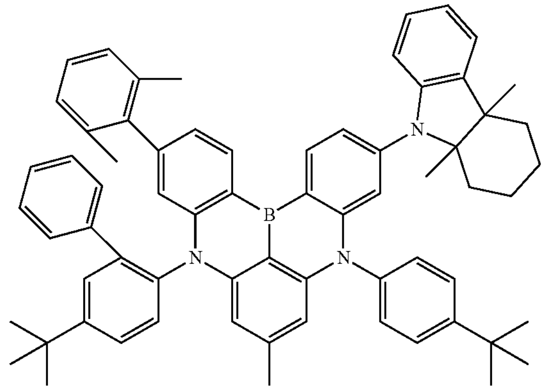
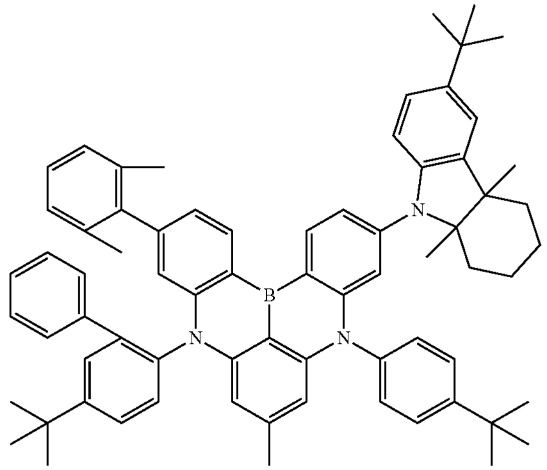
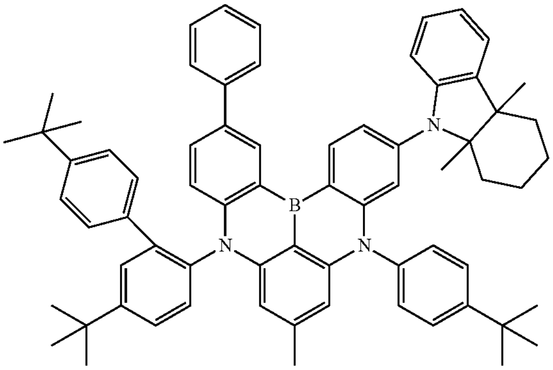
-continued
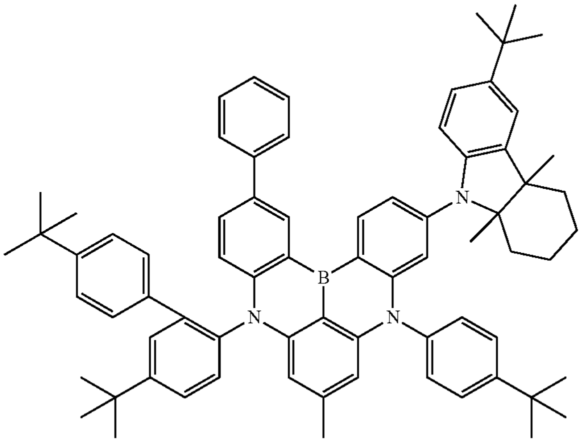
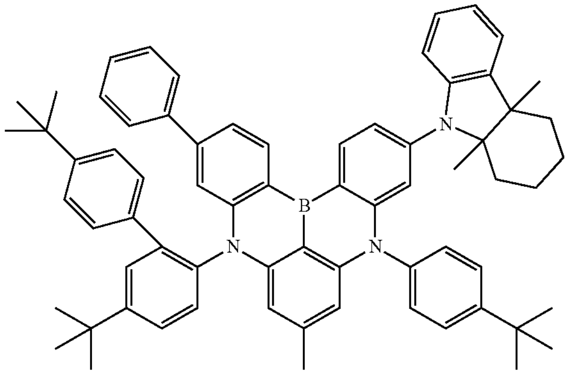
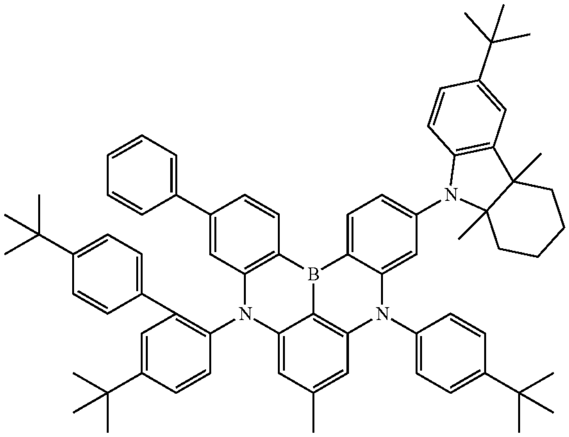
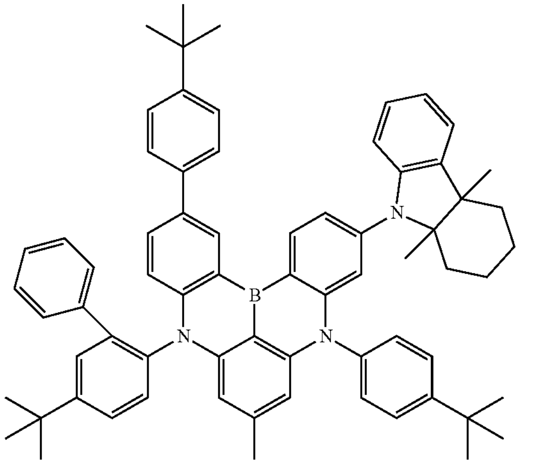

-continued
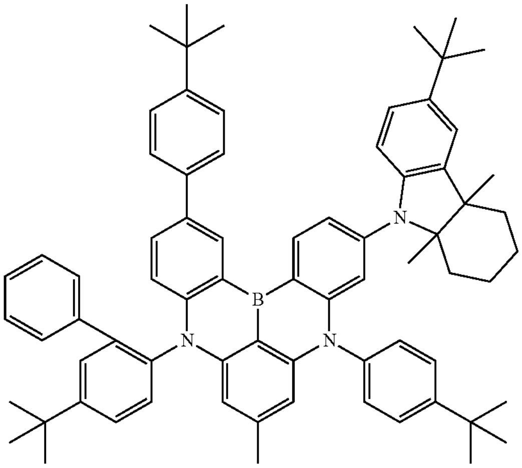
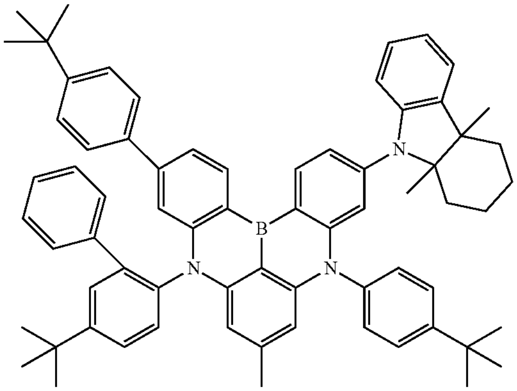
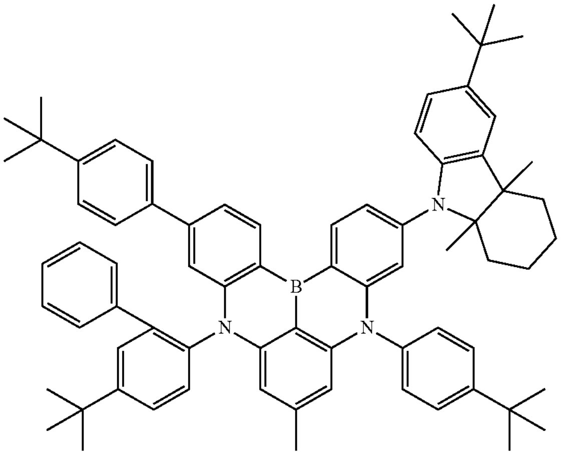
-continued
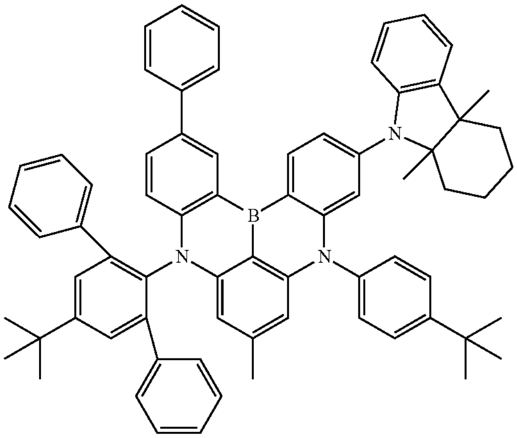
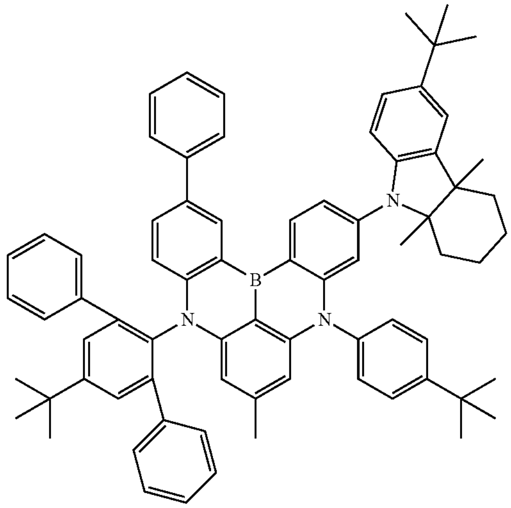
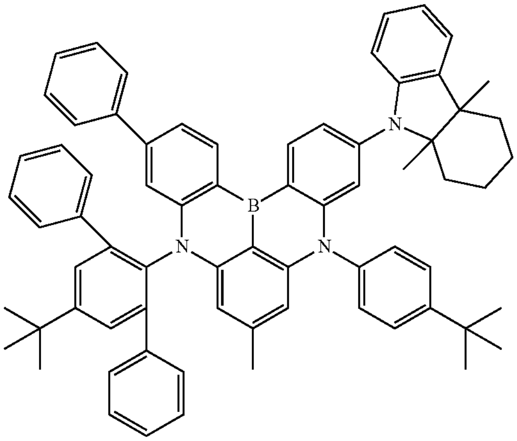

-continued
-continued
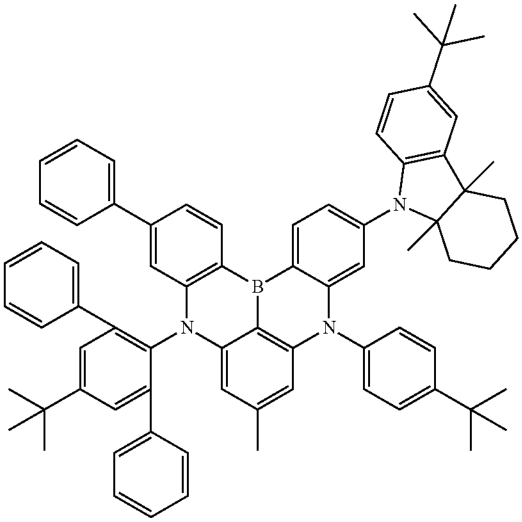
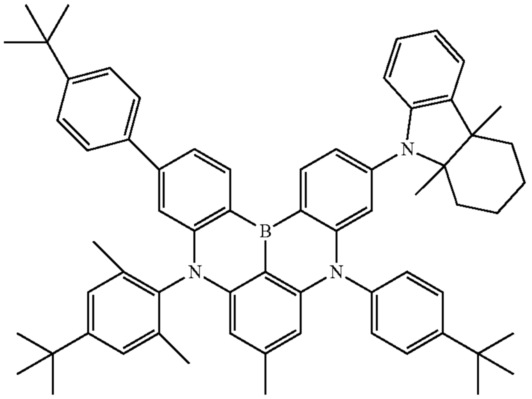
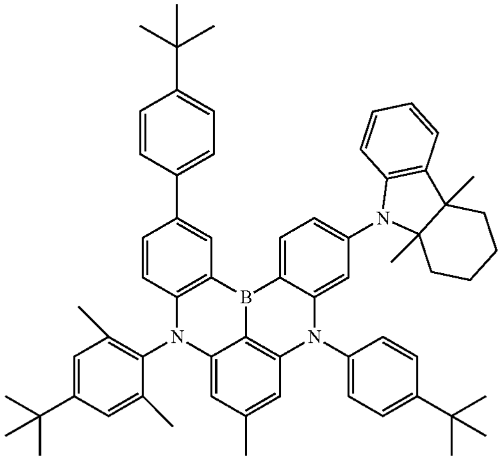
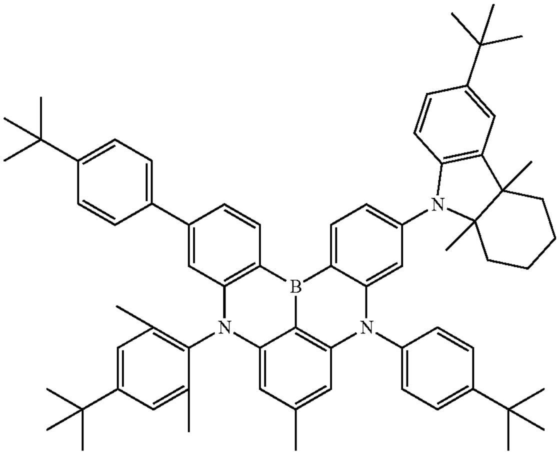
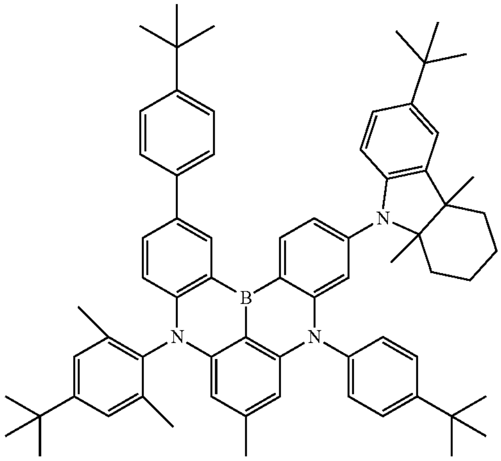
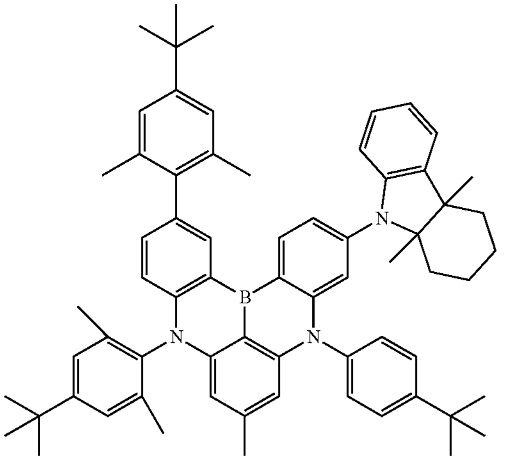

-continued
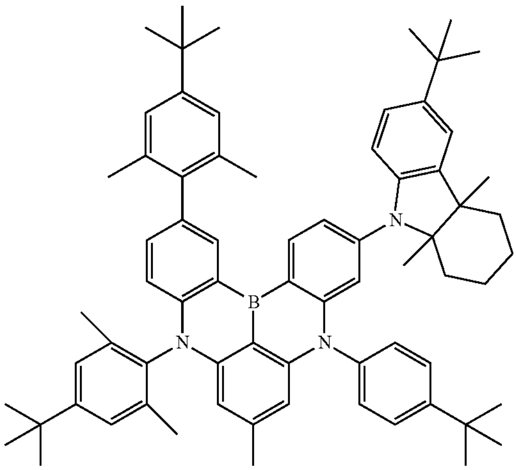
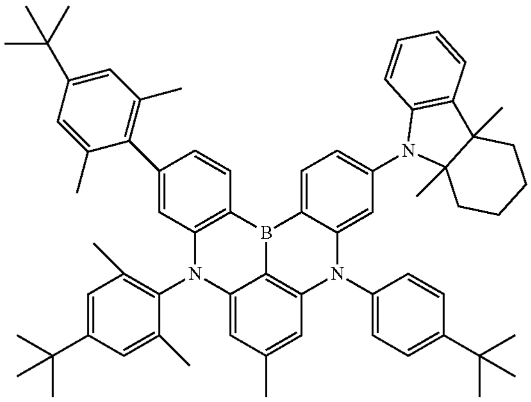
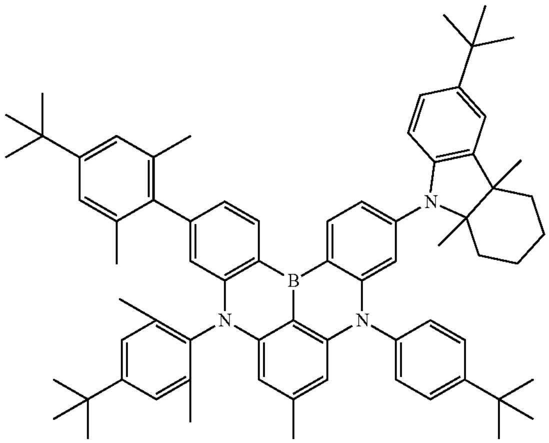
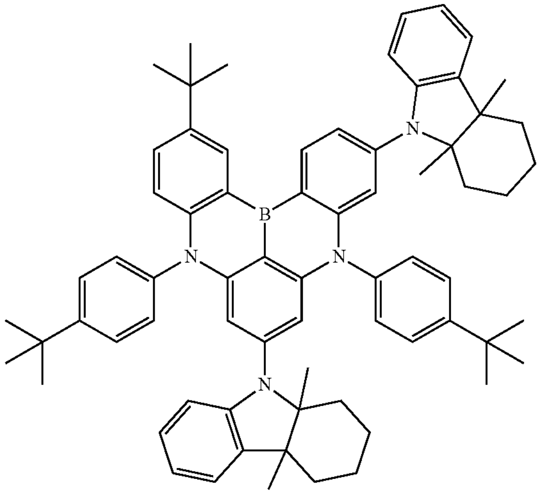
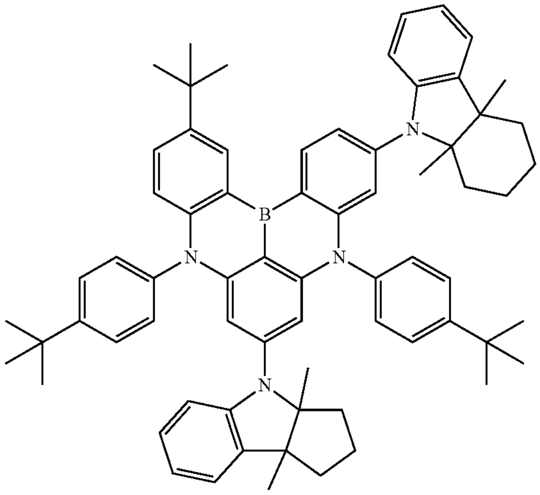
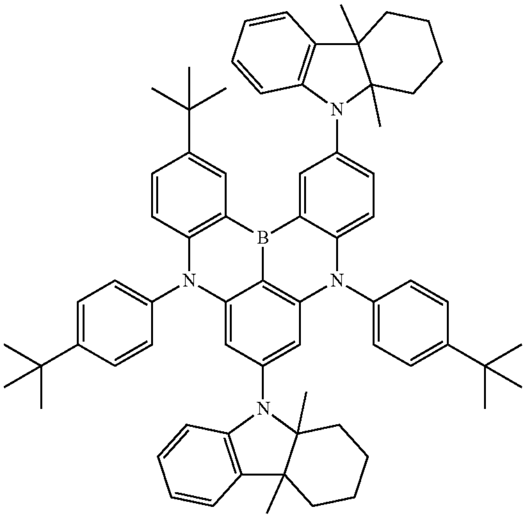

-continued
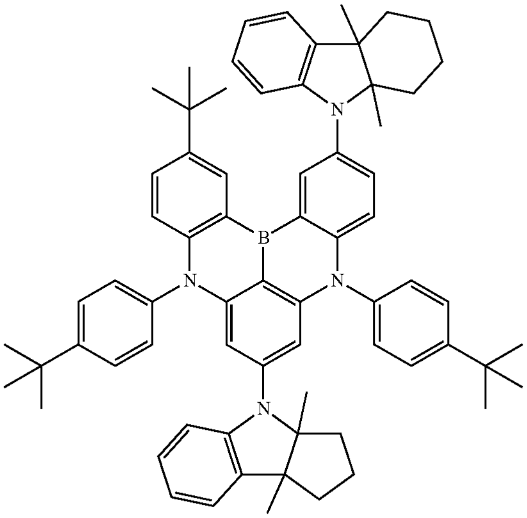
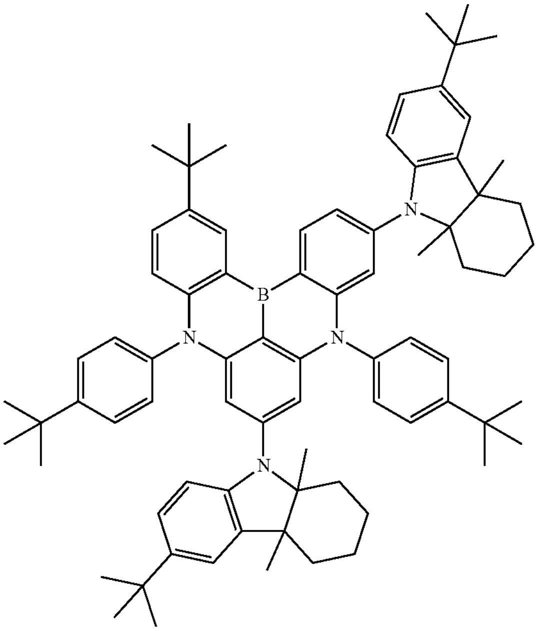
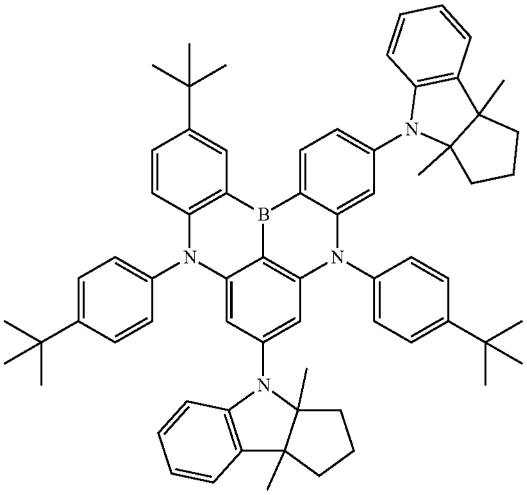
-continued
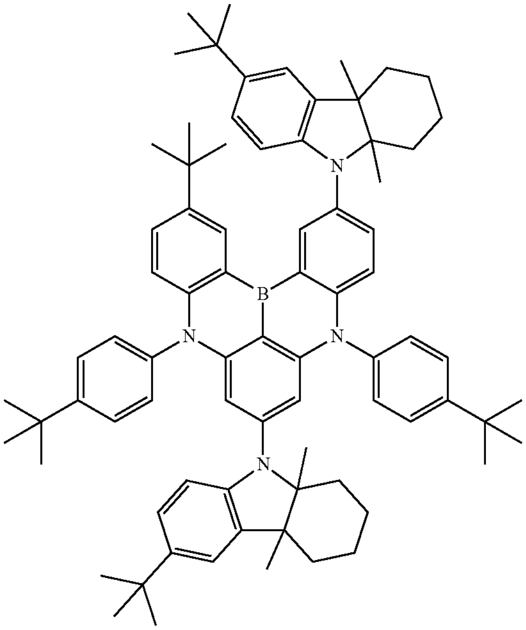
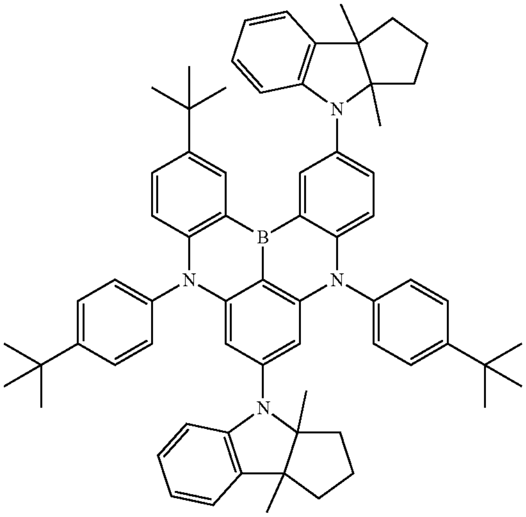

-continued
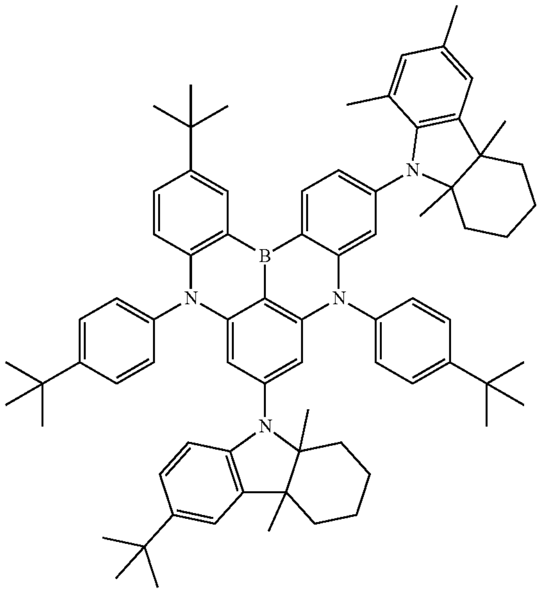
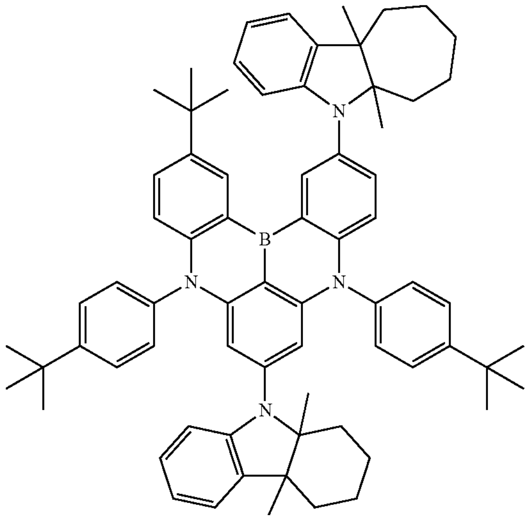
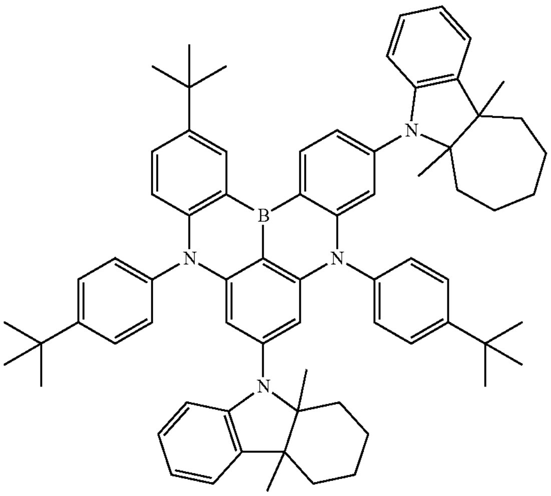
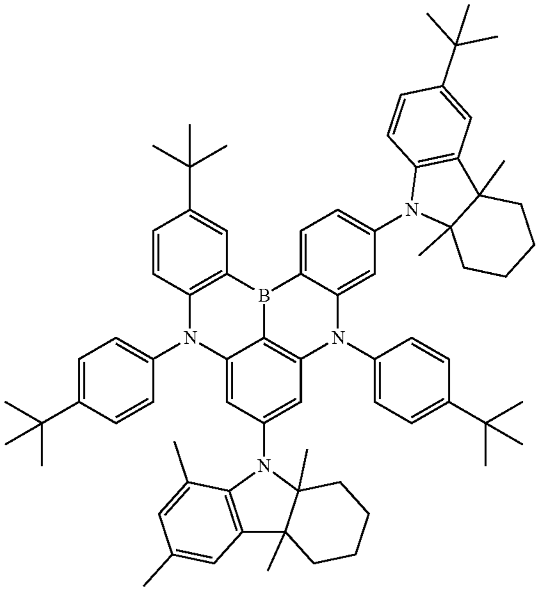
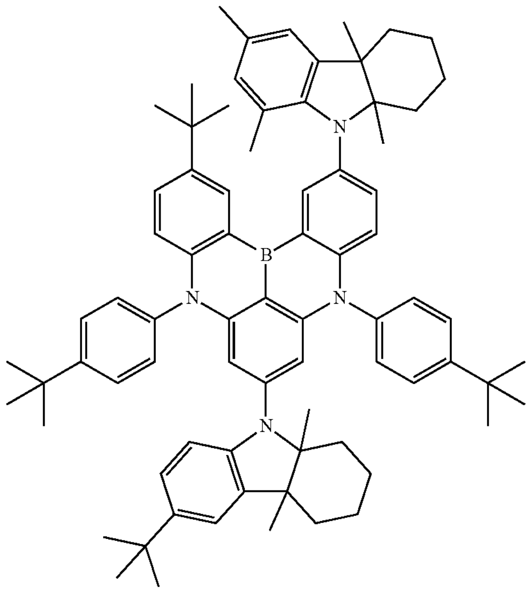
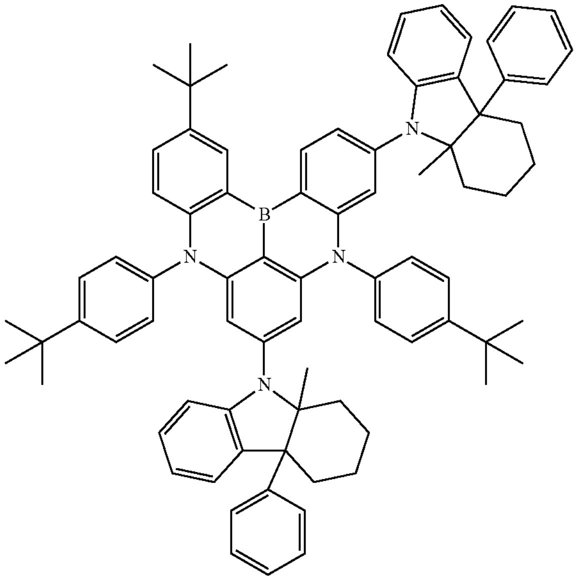
-continued -continued
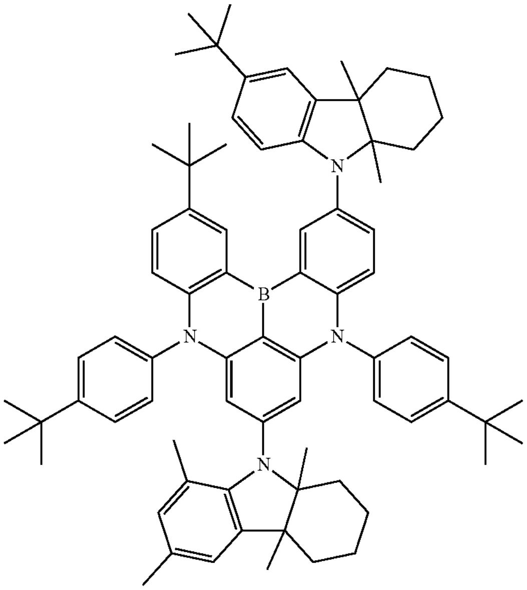
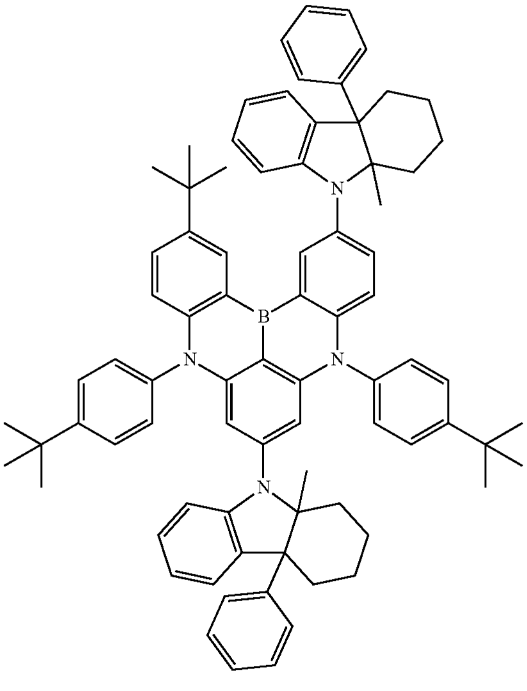
-continued
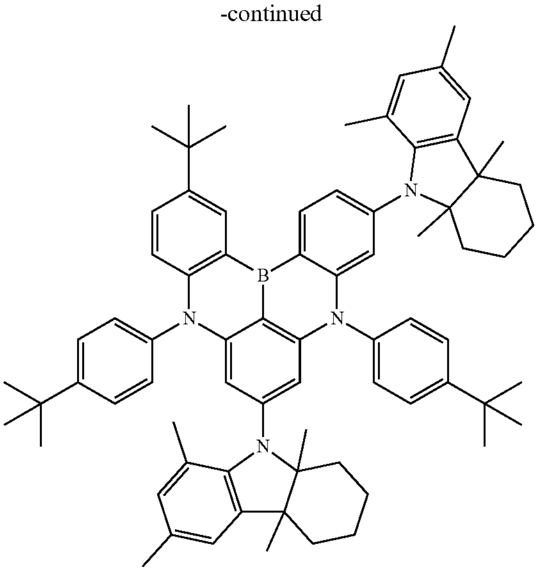
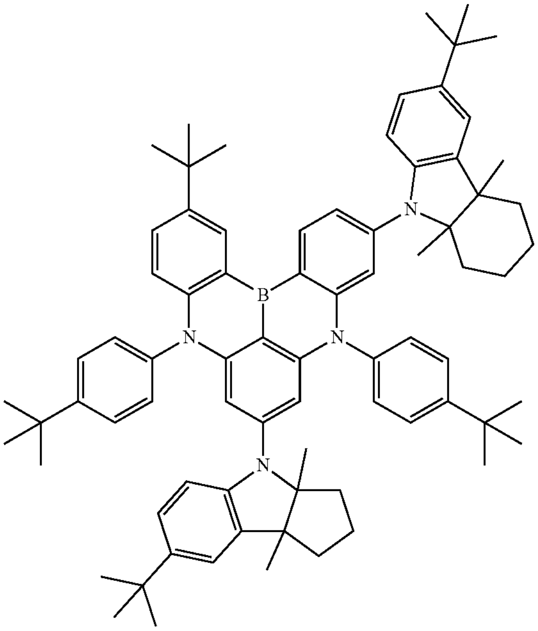
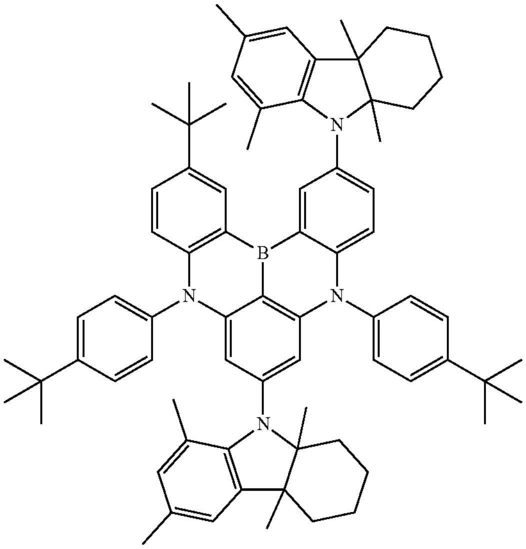

-continued
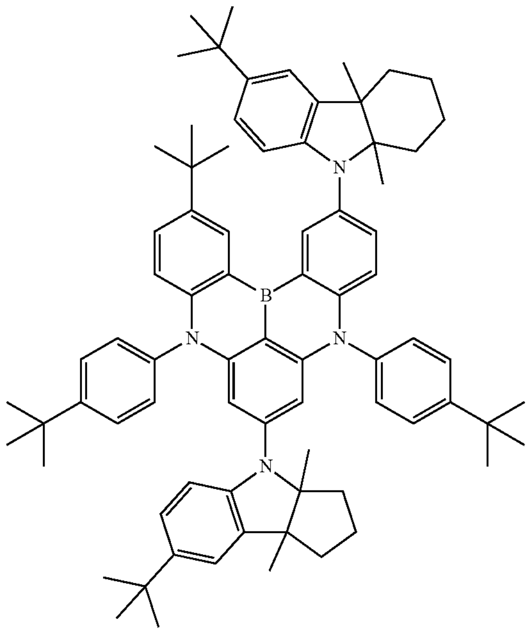
-continued
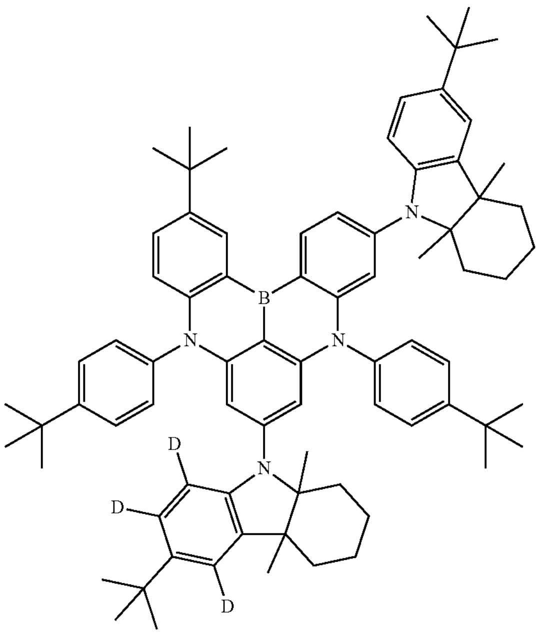
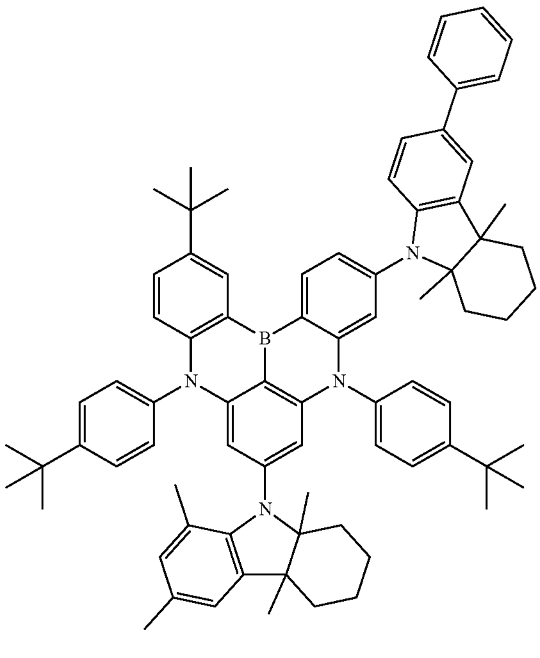
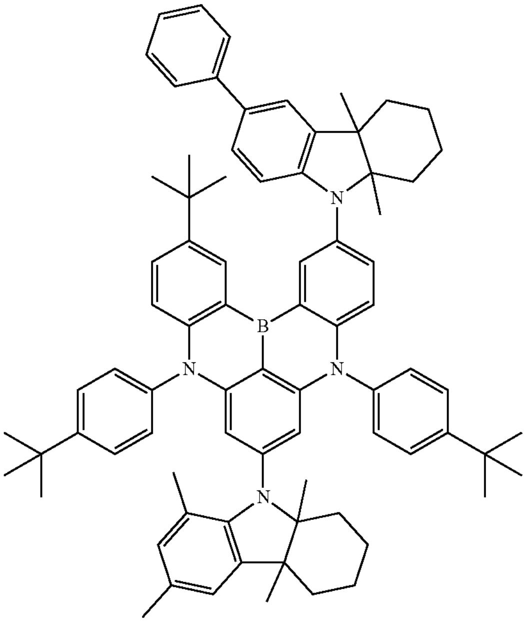

-continued
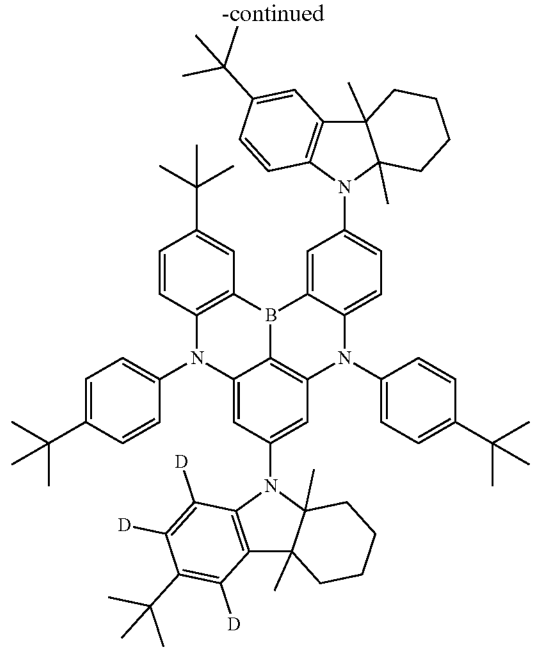
-continued
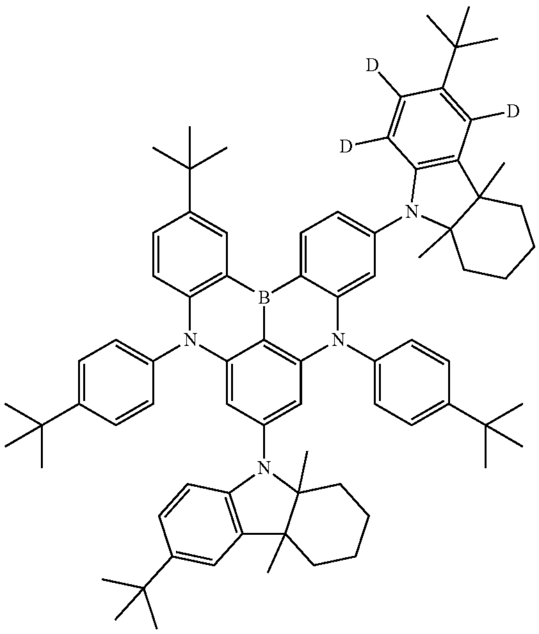
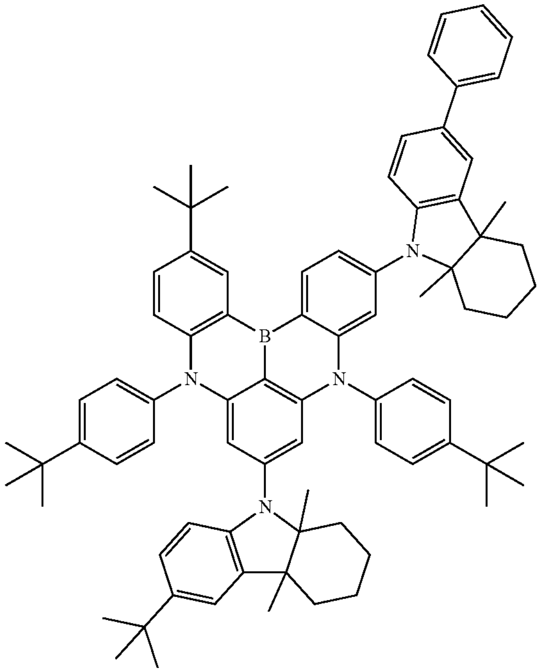
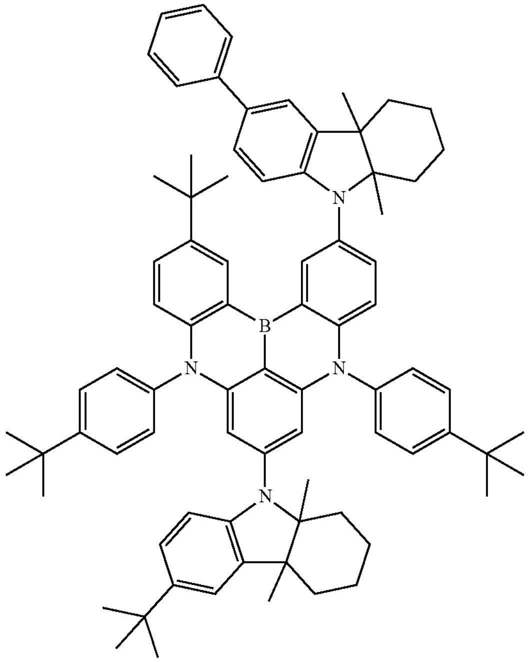

-continued
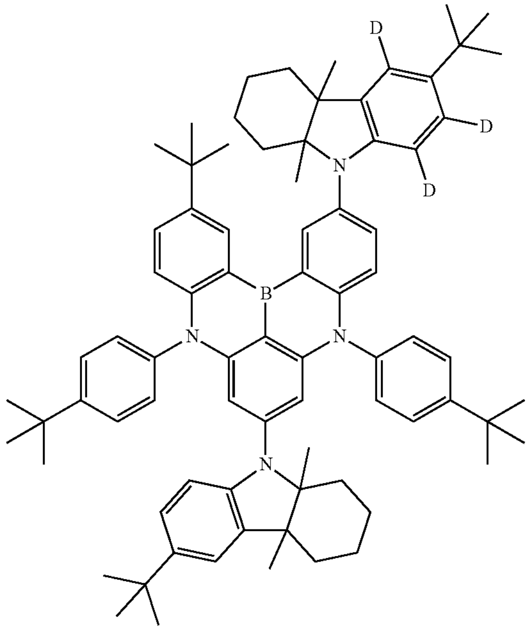
-continued
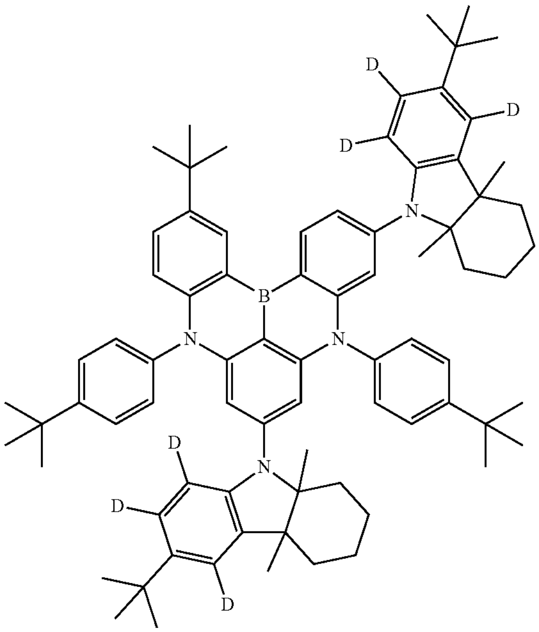
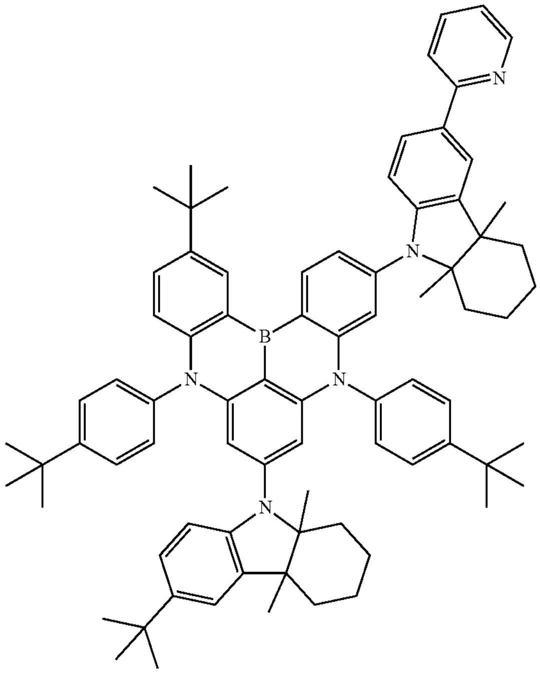
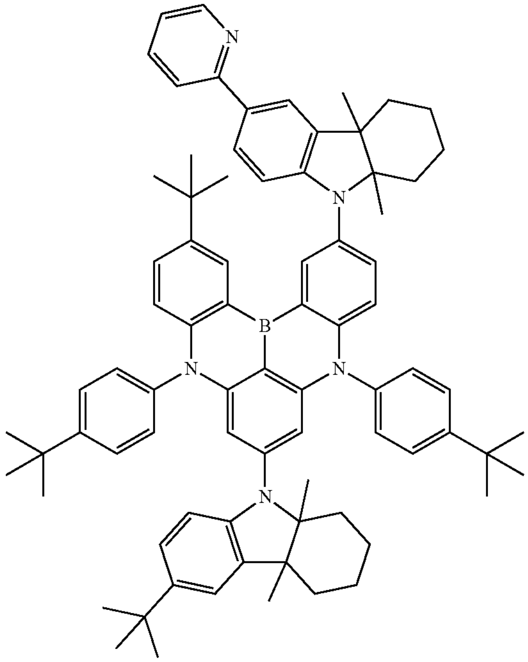

-continued
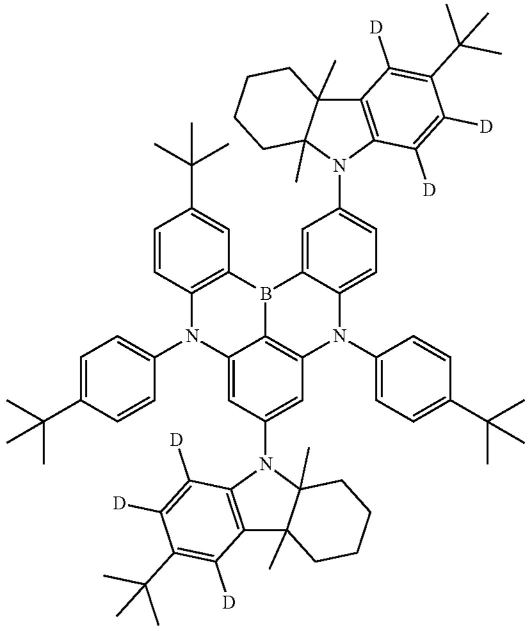
-continued
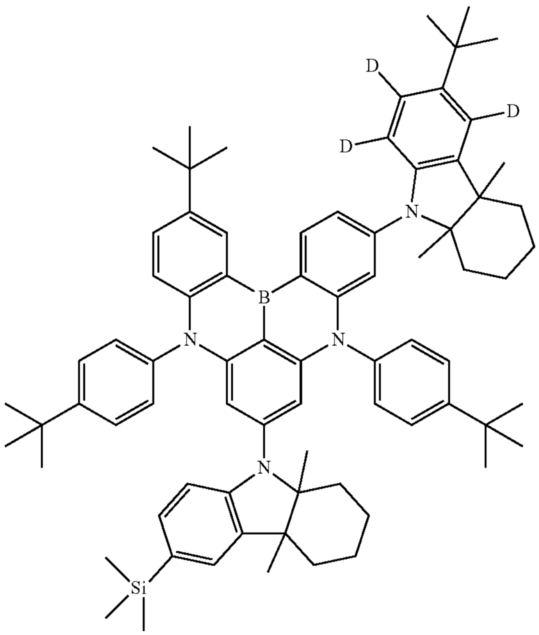
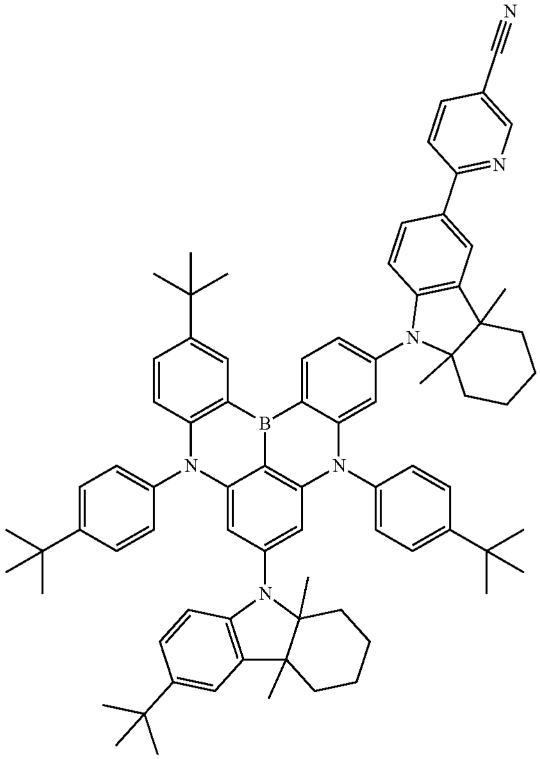
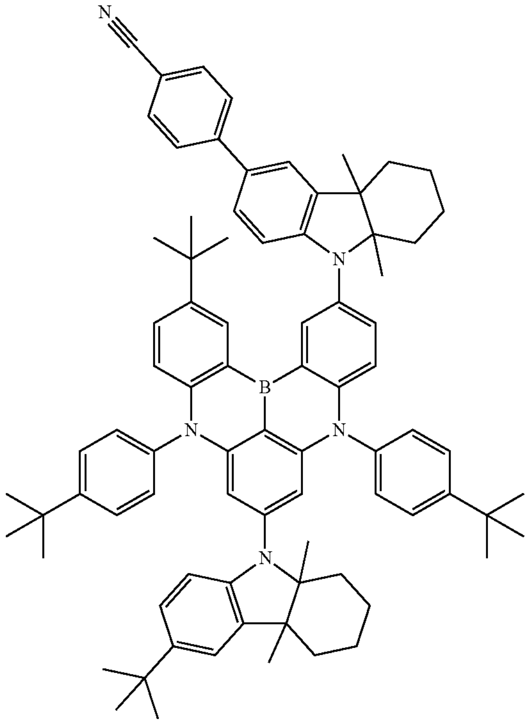

-continued
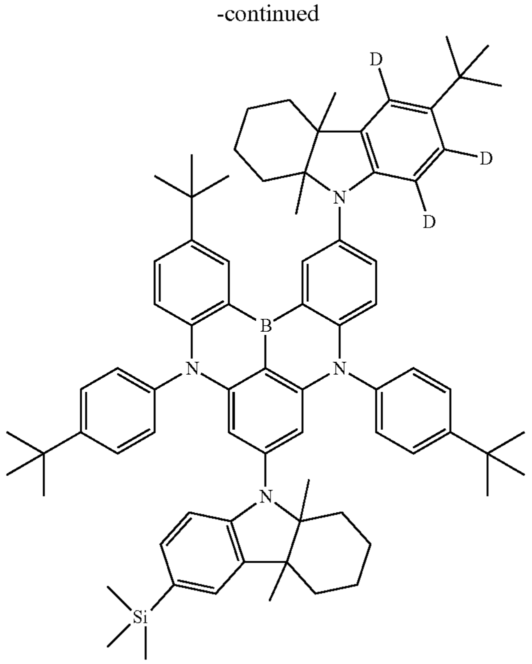
-continued
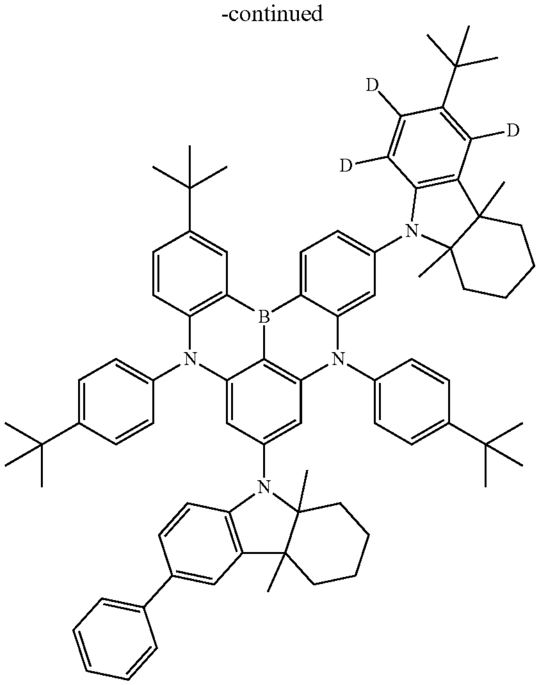
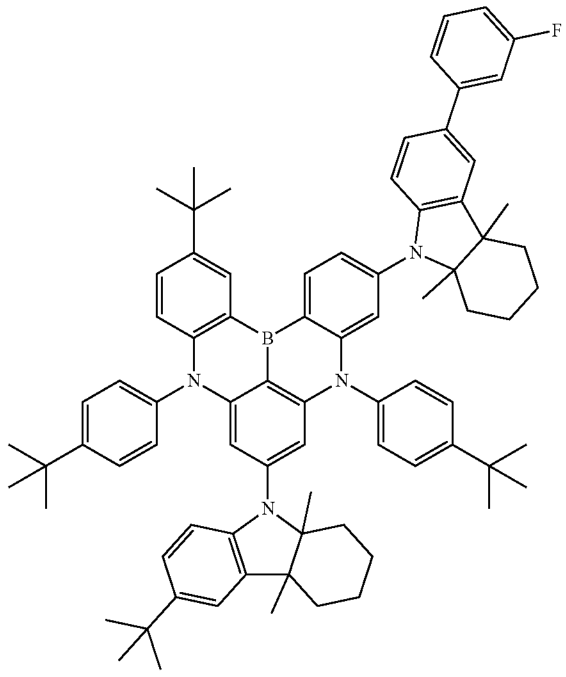
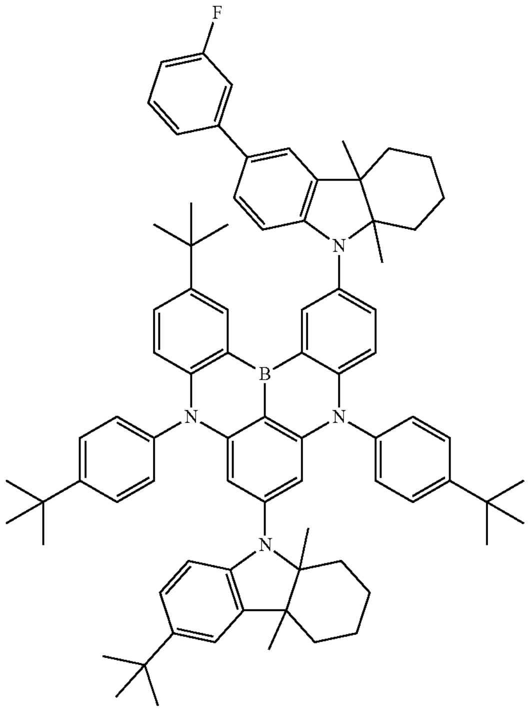

-continued
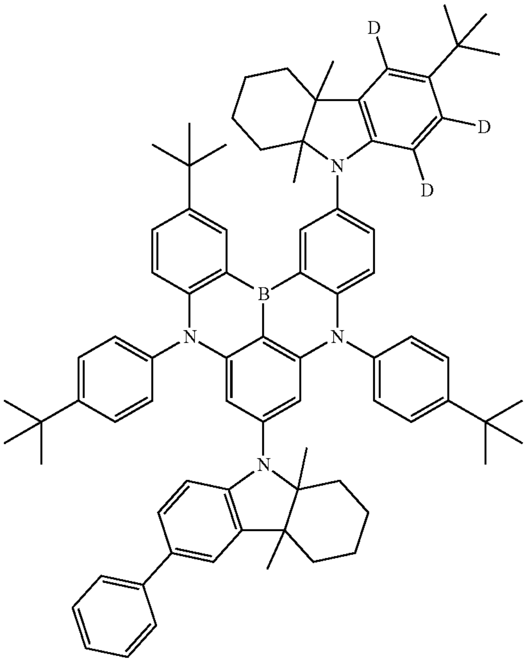
-continued
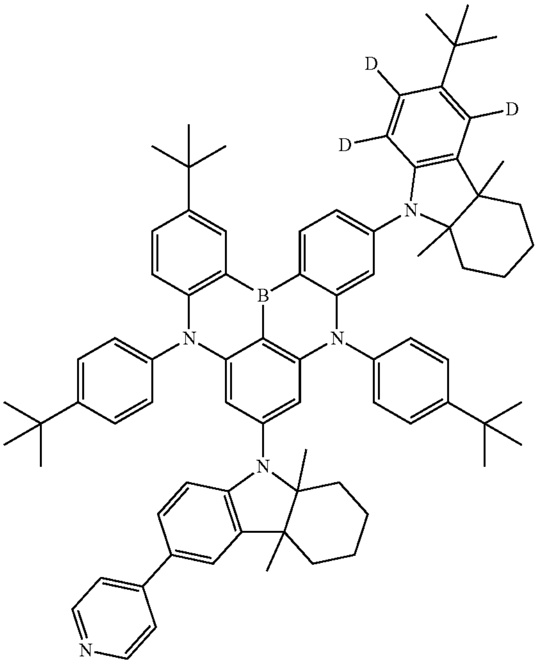
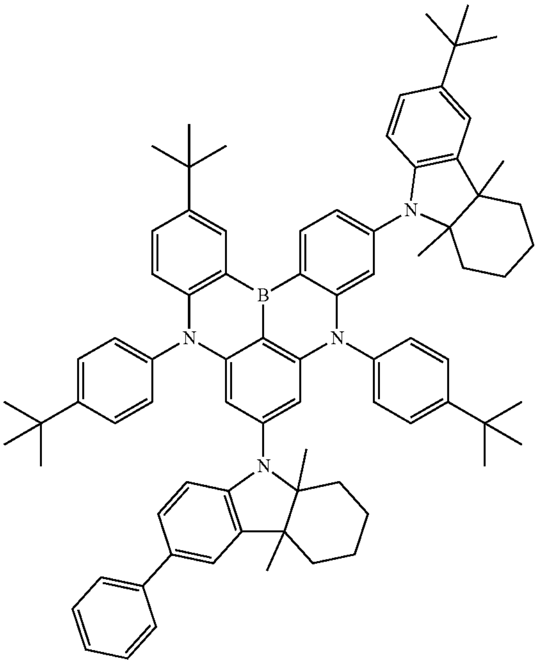
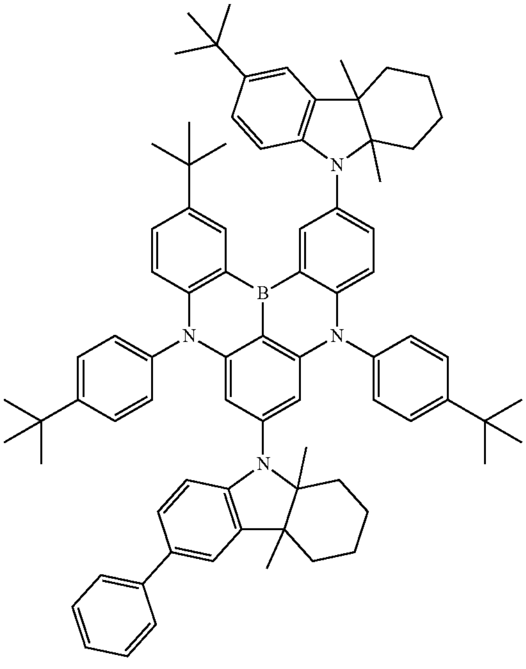

-continued
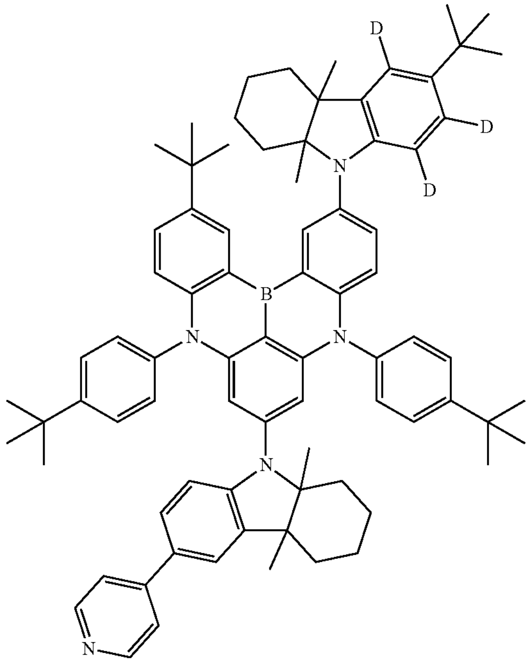
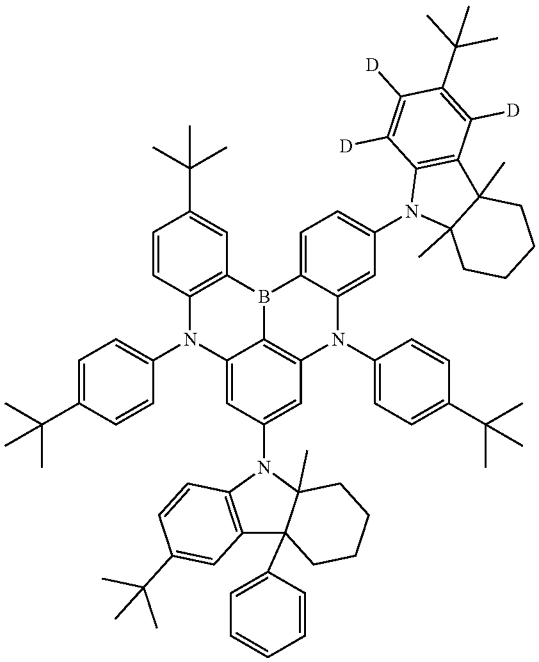
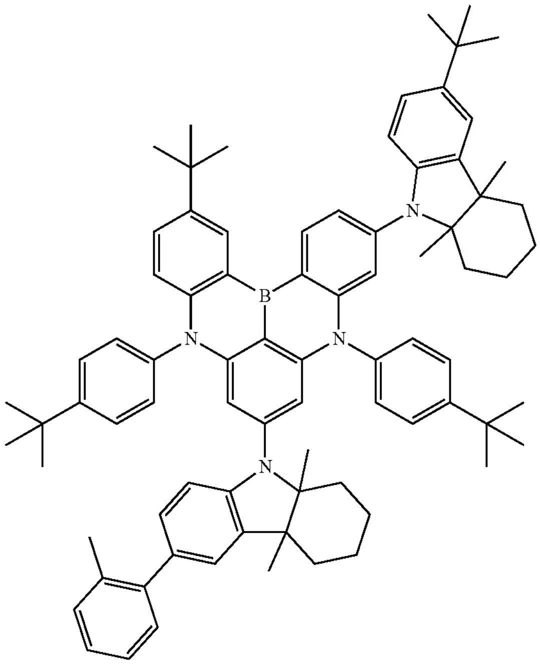
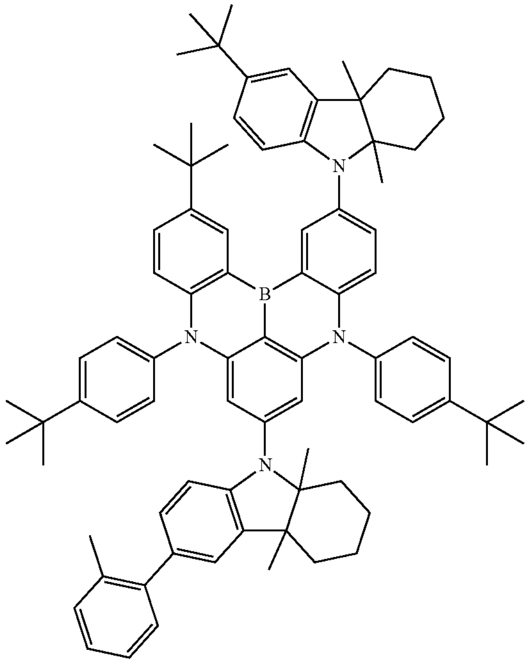

-continued
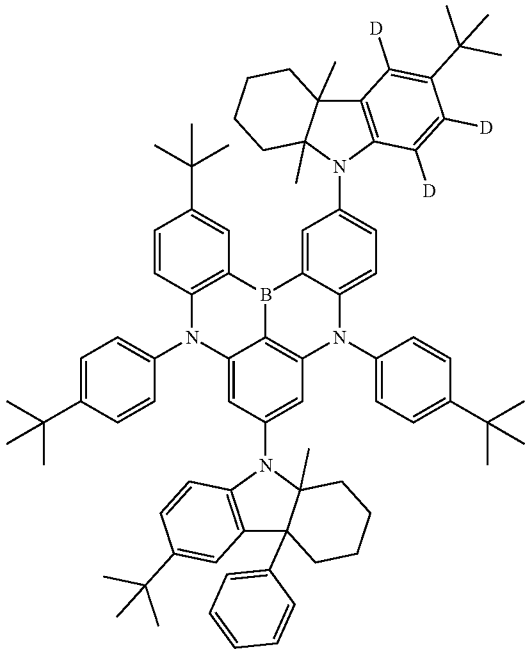
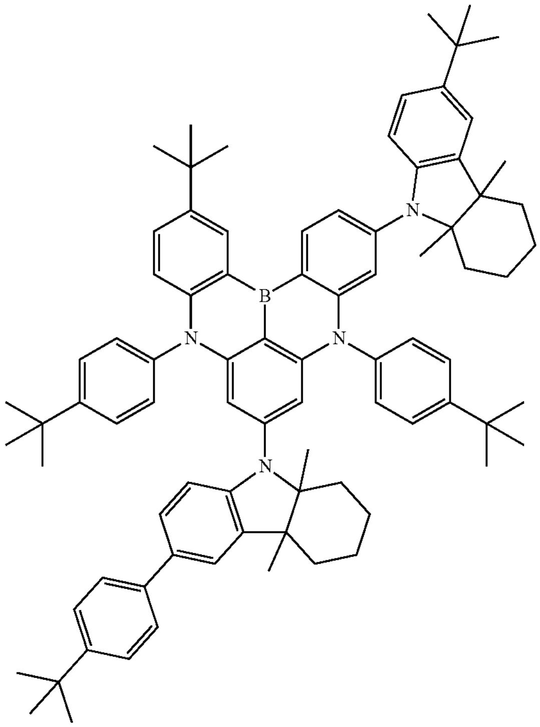
-continued
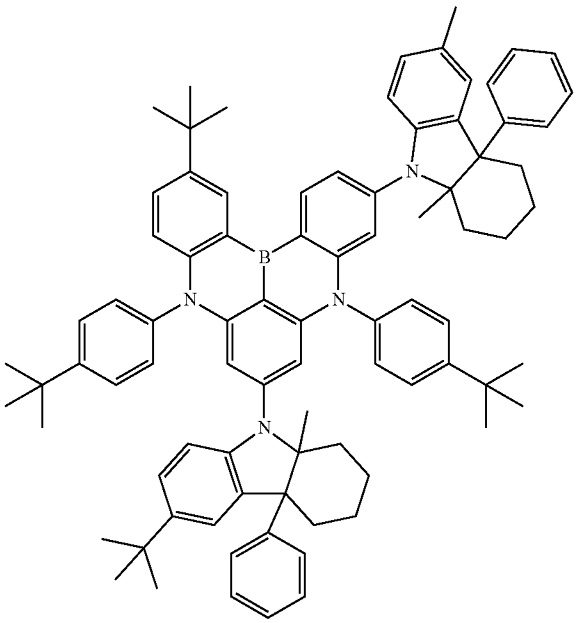
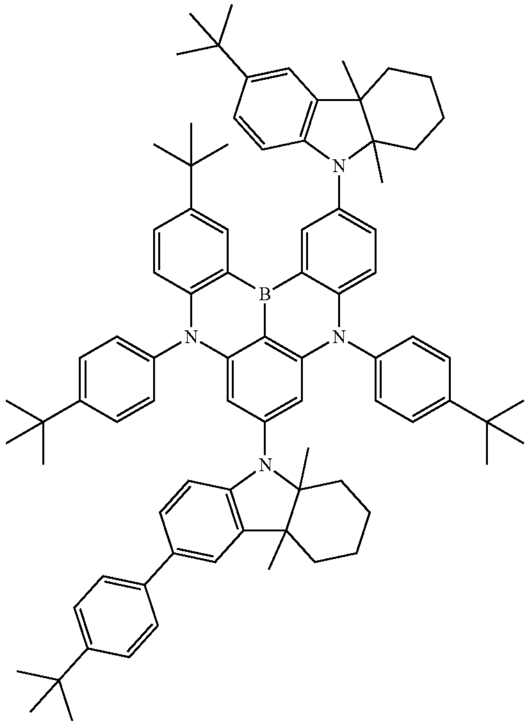

-continued
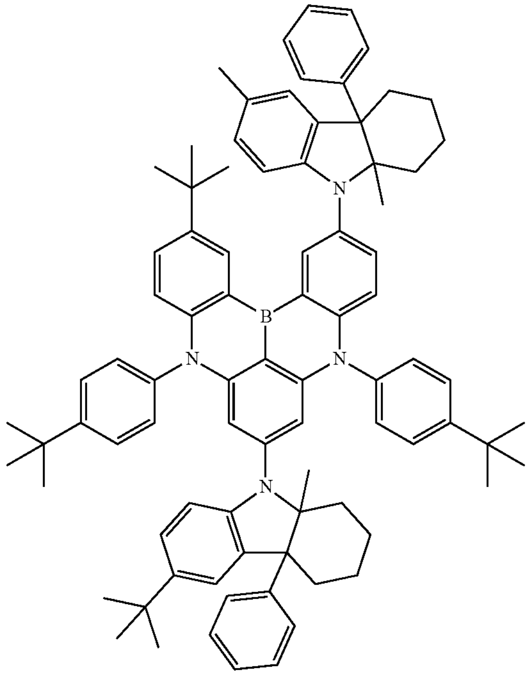
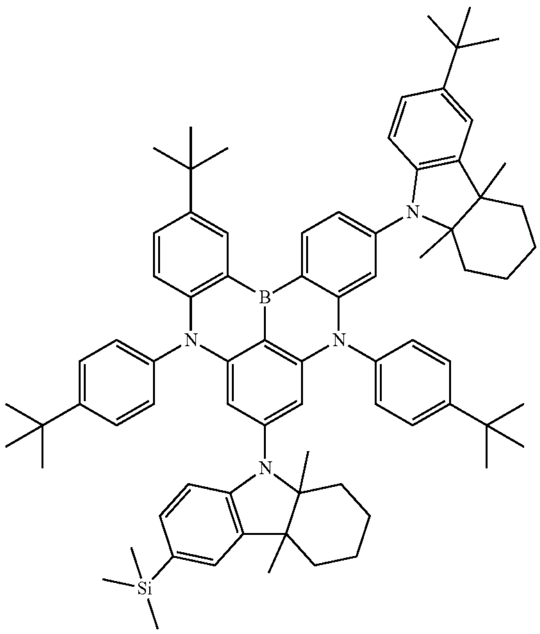
-continued
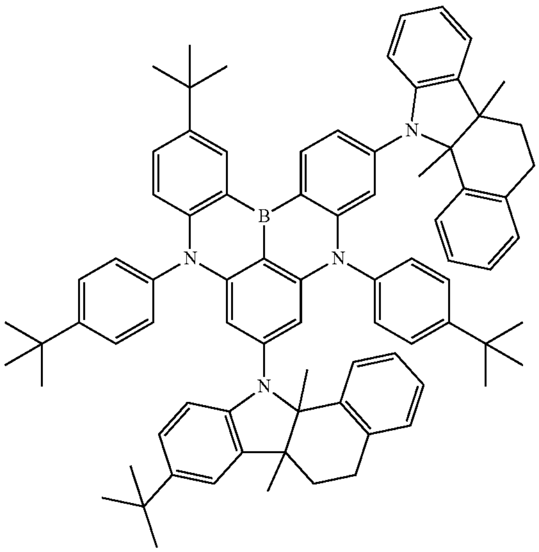
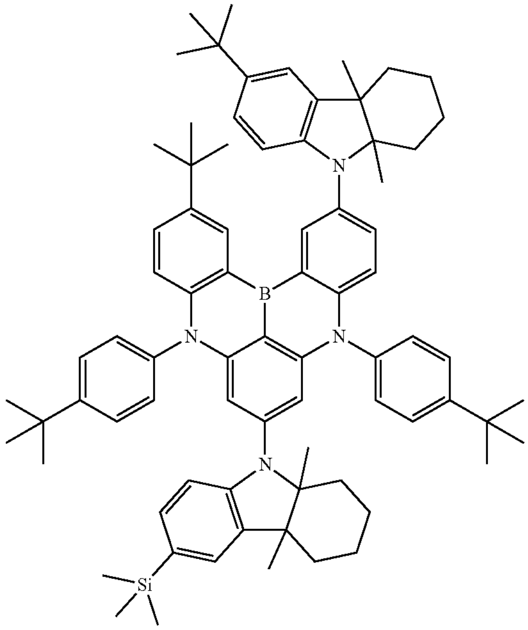

-continued
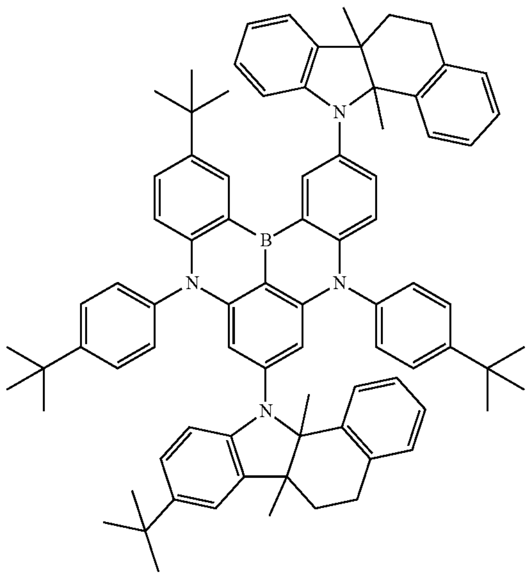
-continued
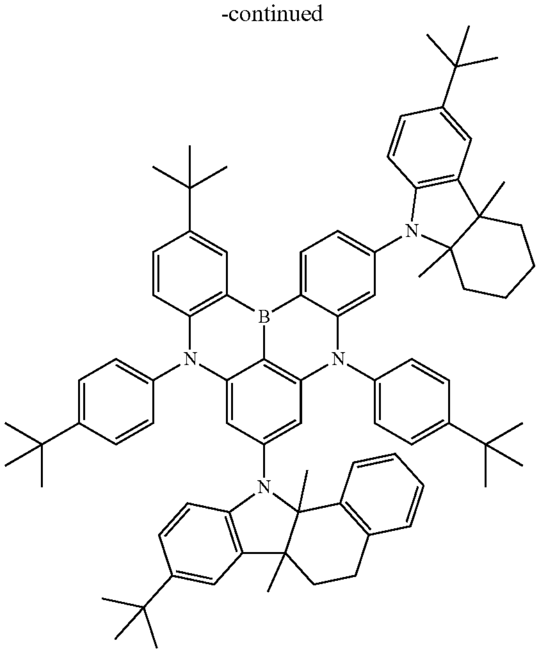
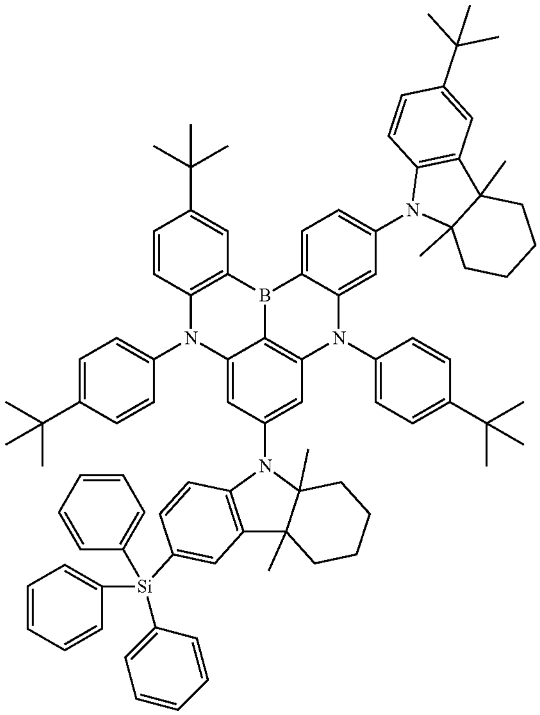
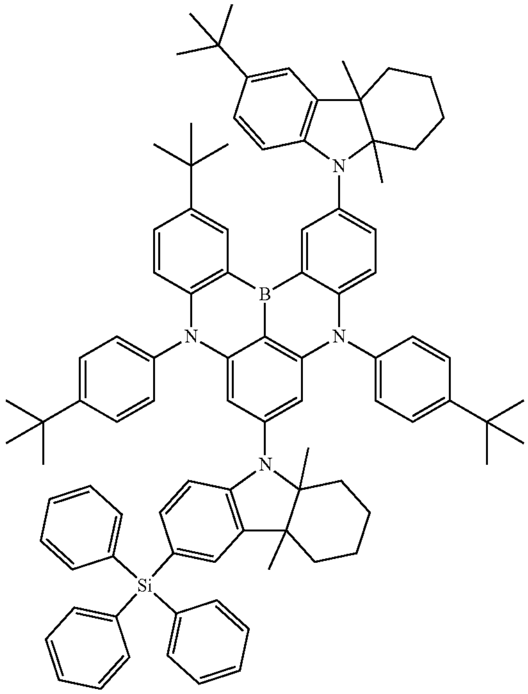

-continued
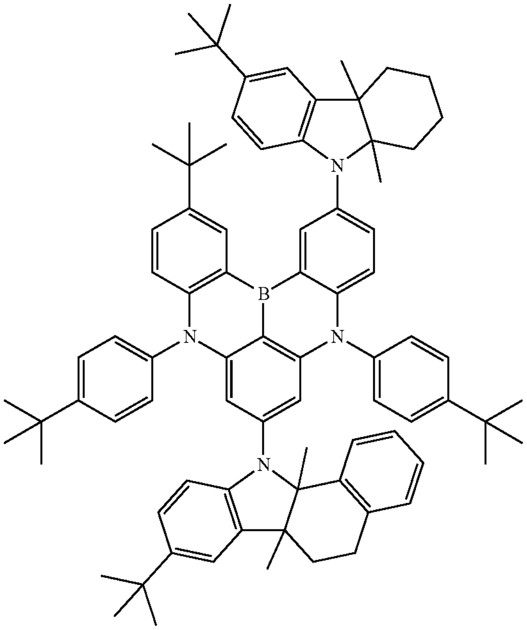
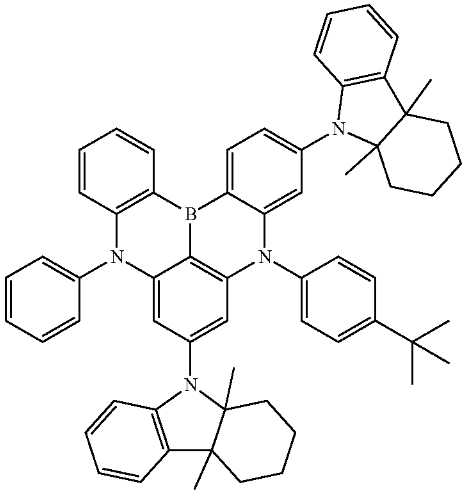
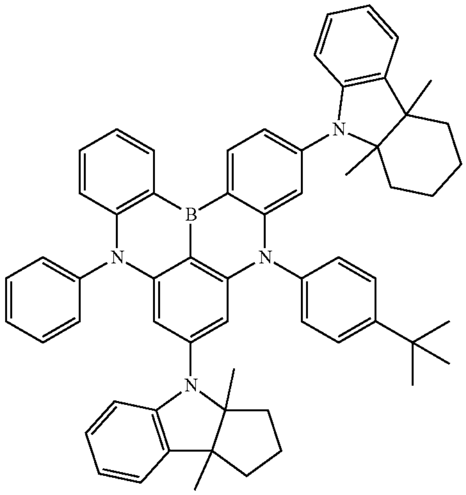
-continued
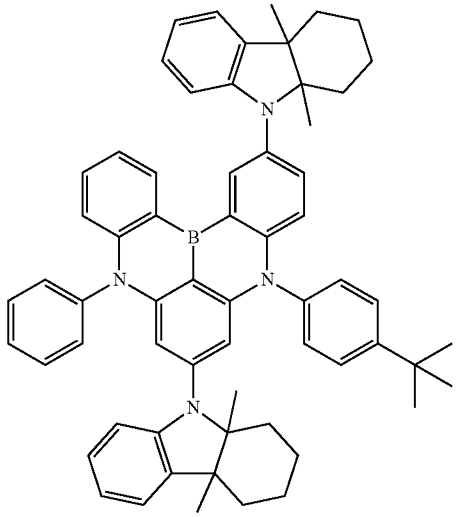
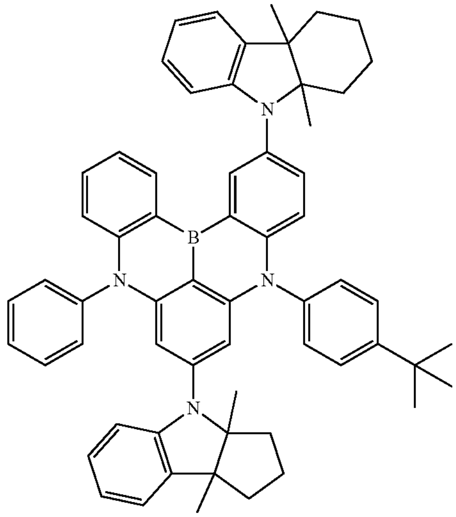
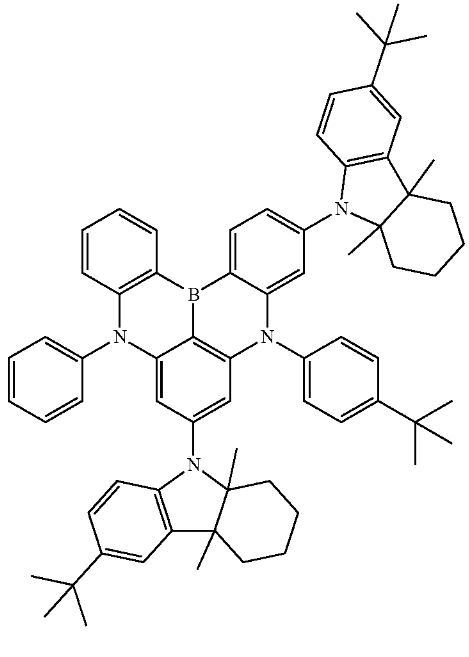

-continued
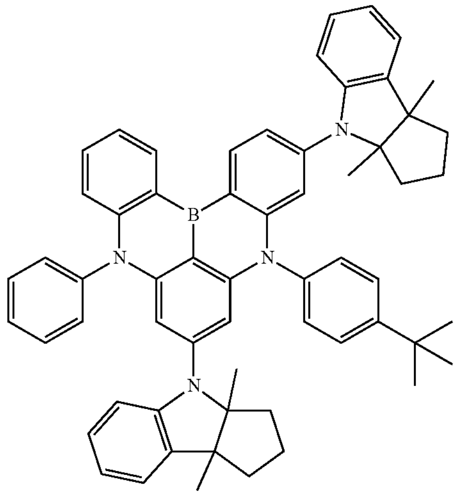
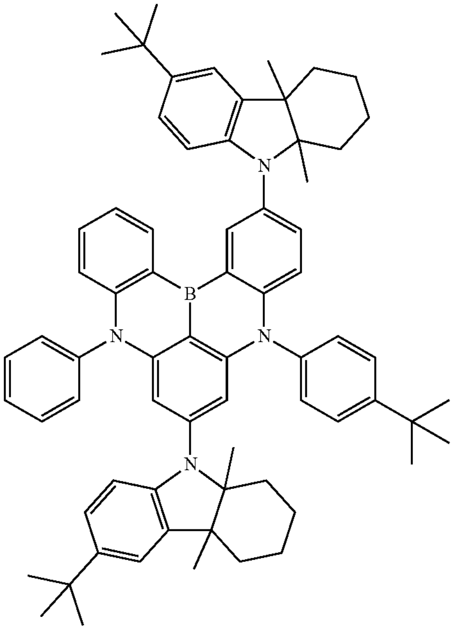
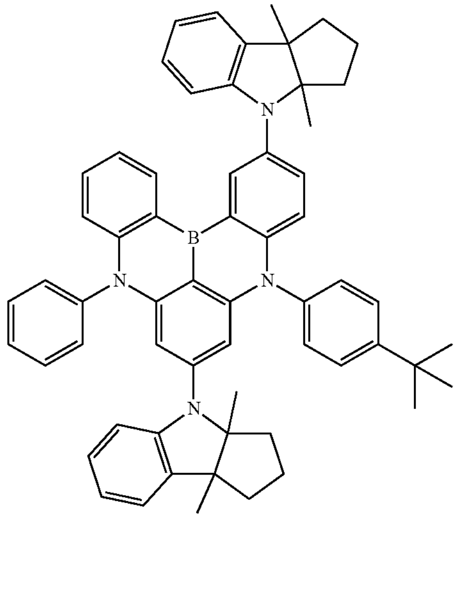
-continued
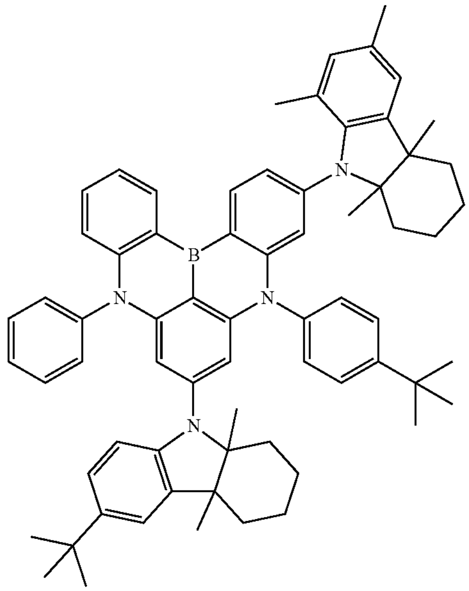
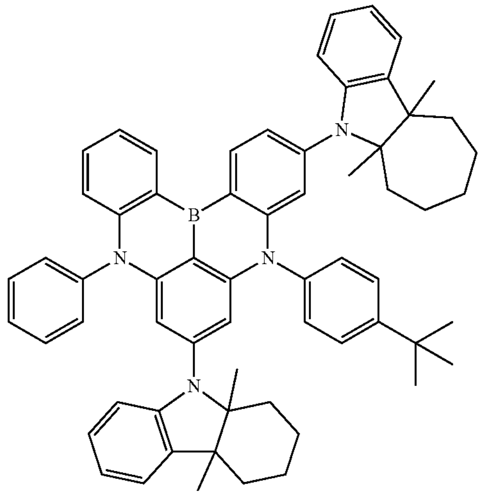
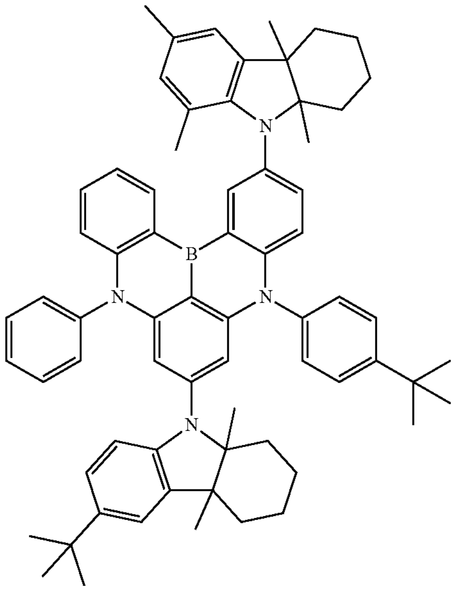

-continued
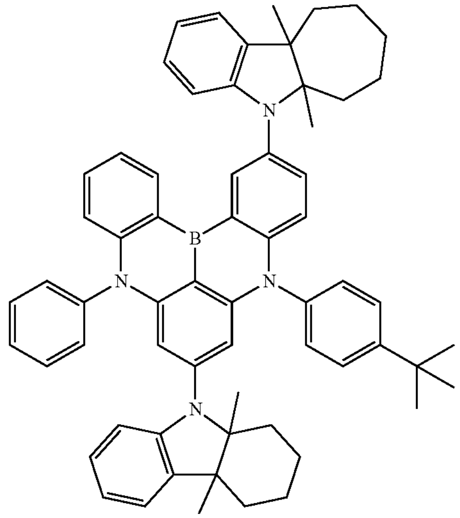
-continued
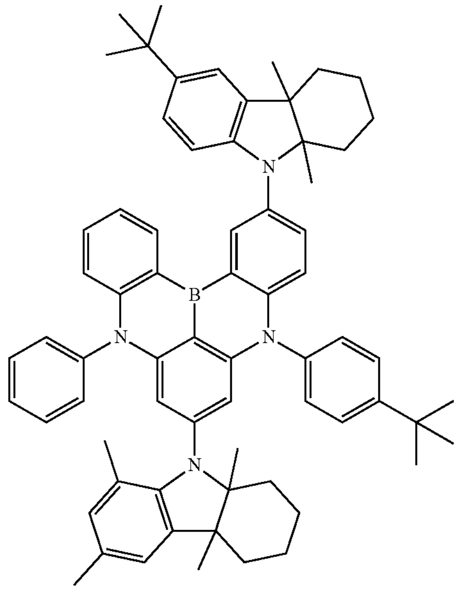
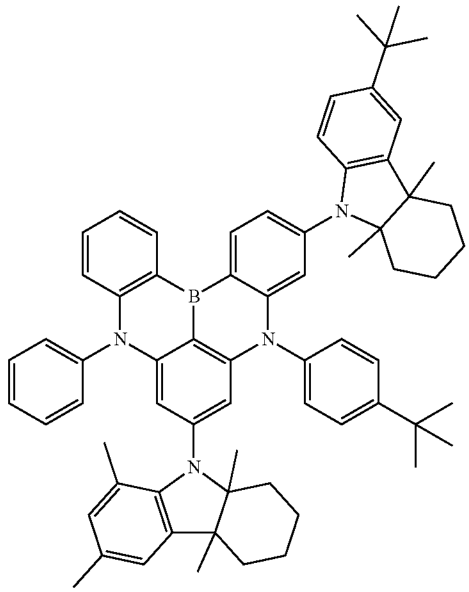
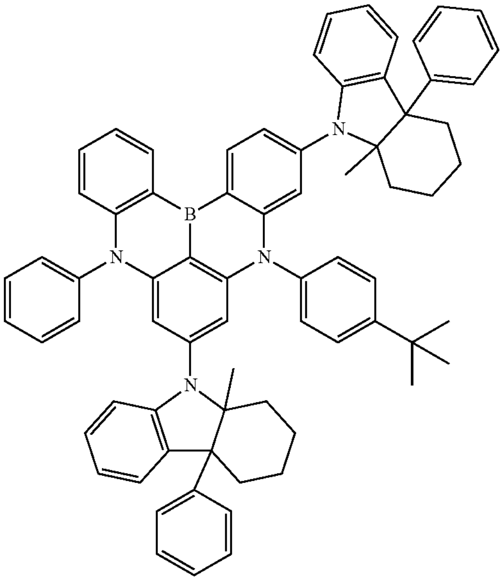
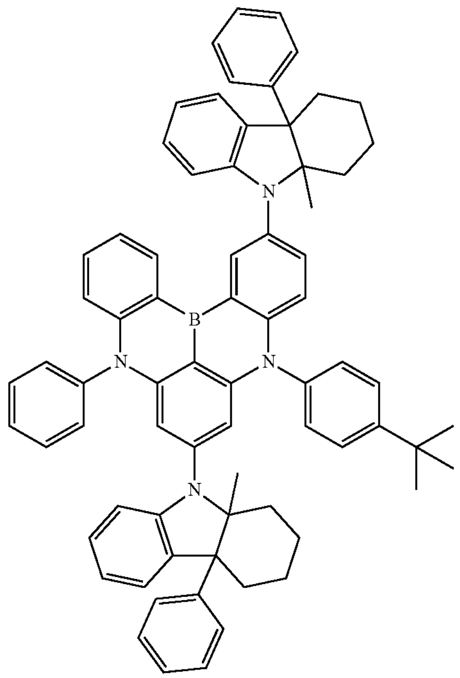

-continued
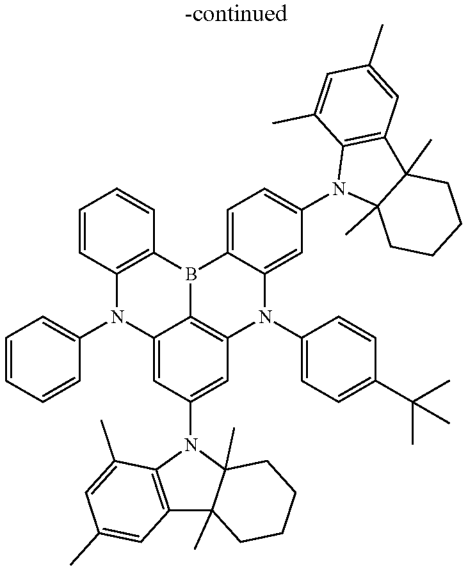
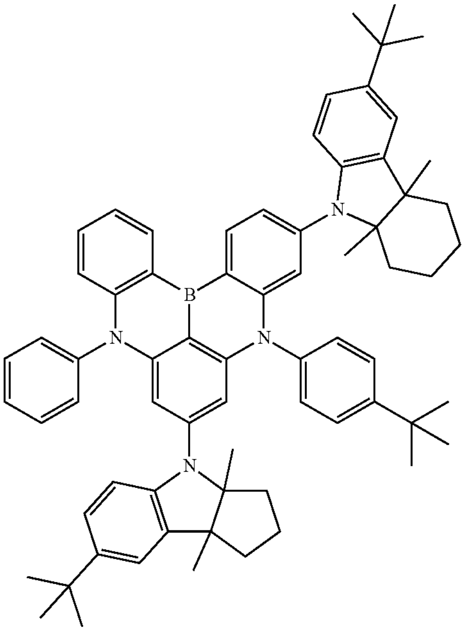
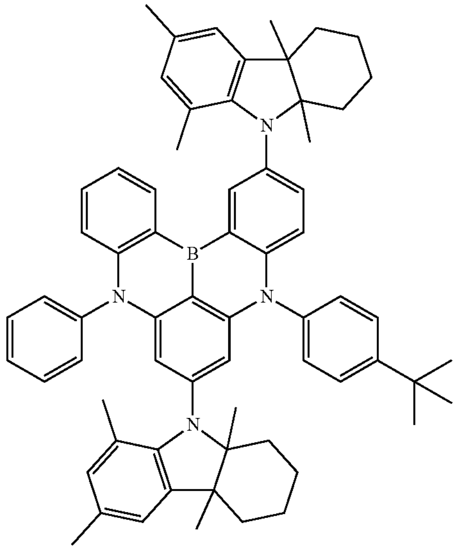
-continued
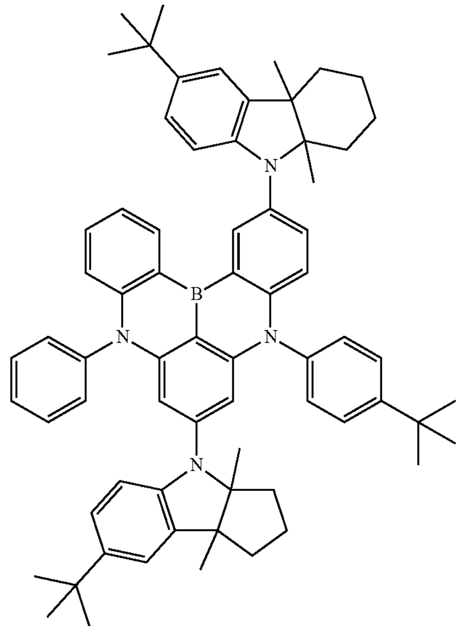
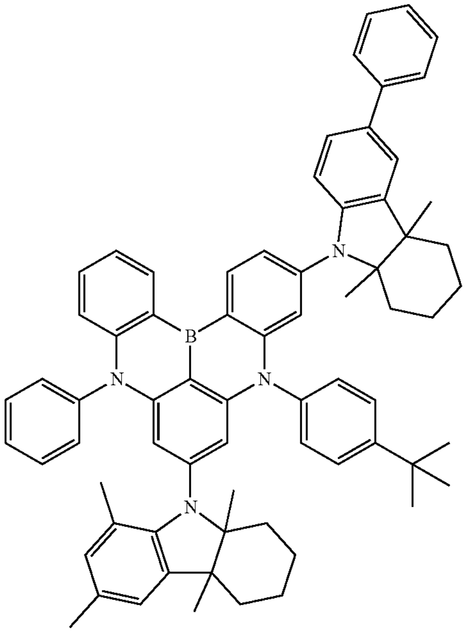

-continued
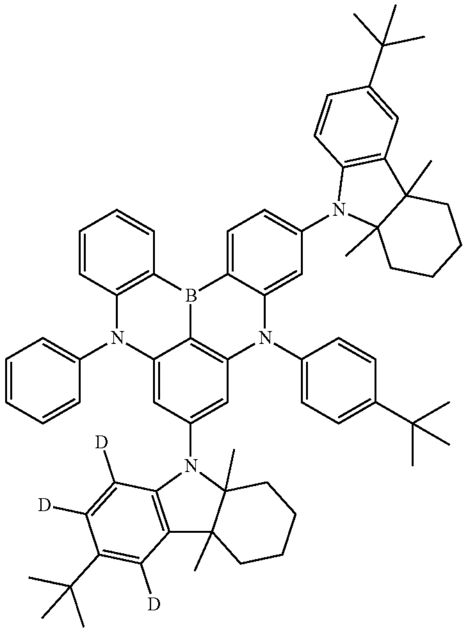
-continued
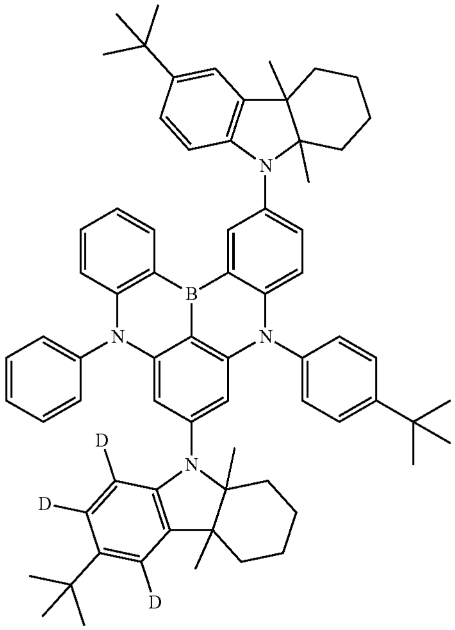
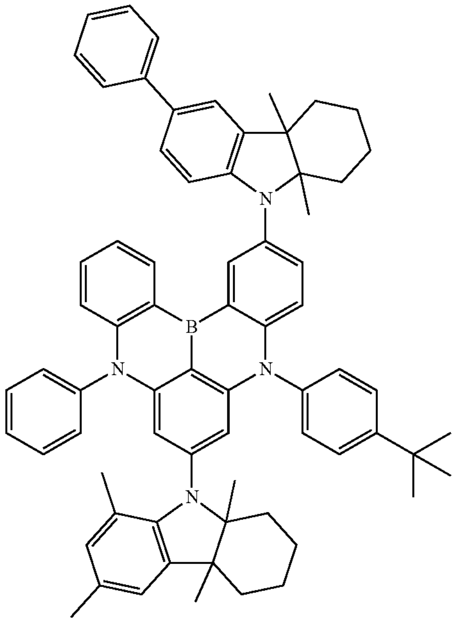
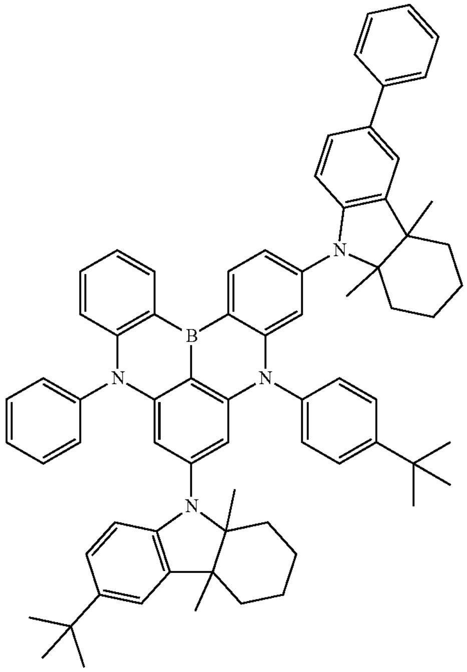

-continued
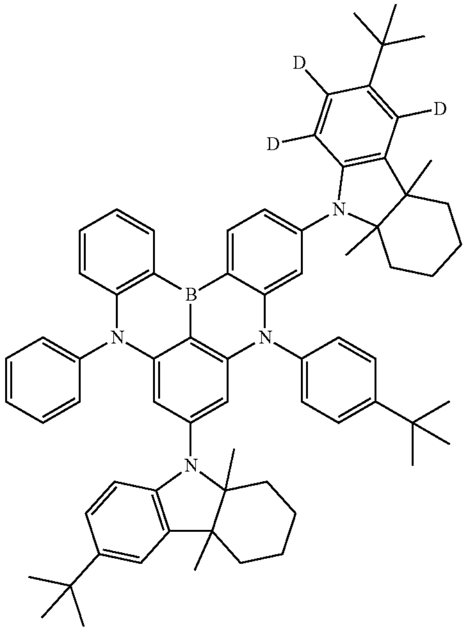
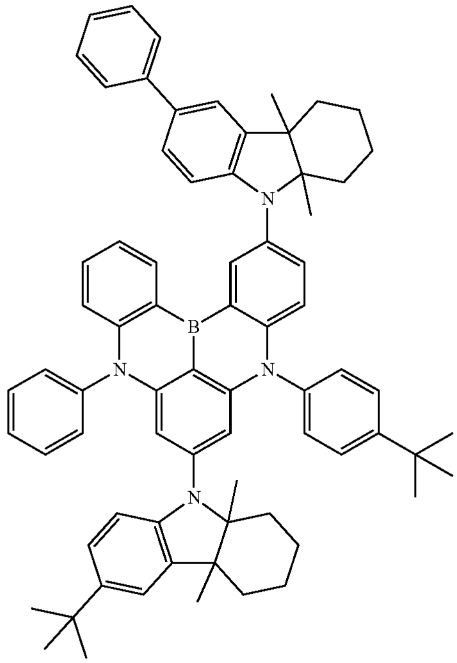
-continued
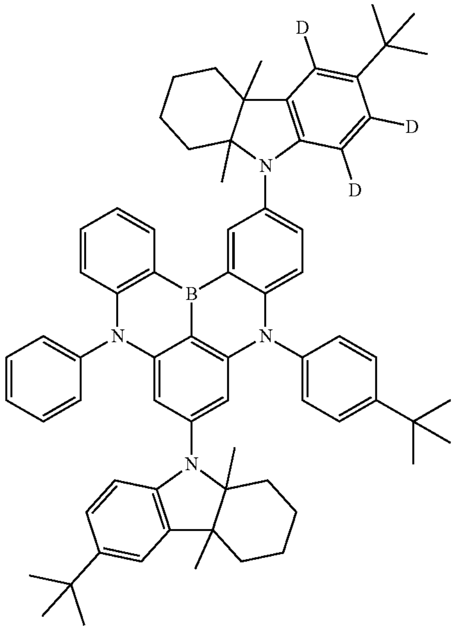
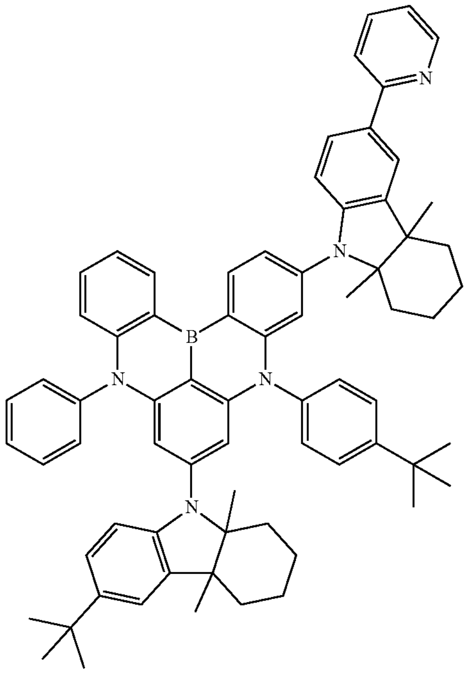

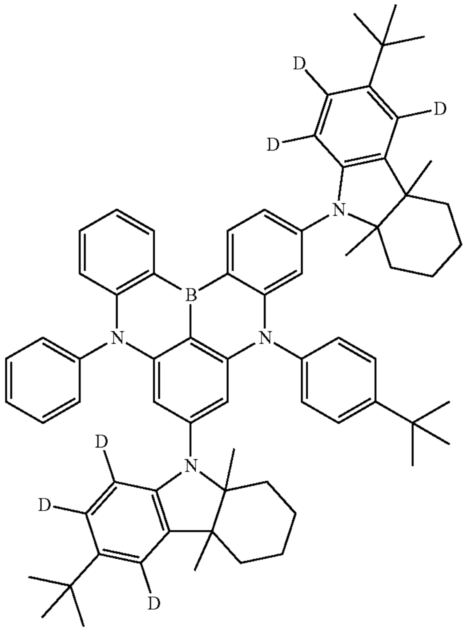
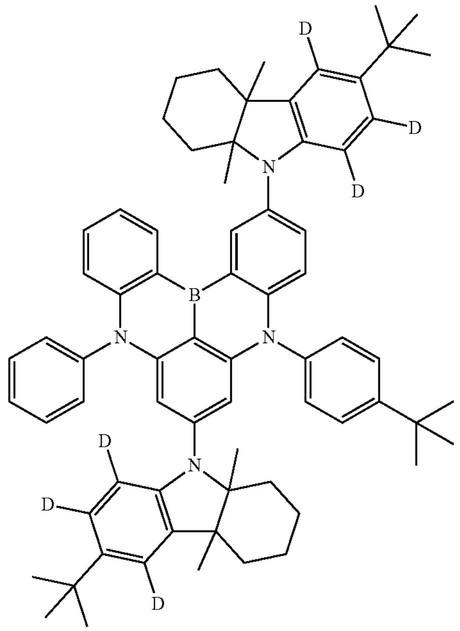
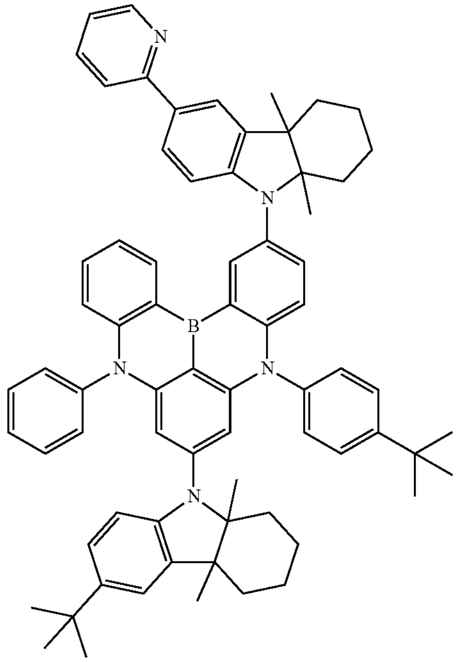
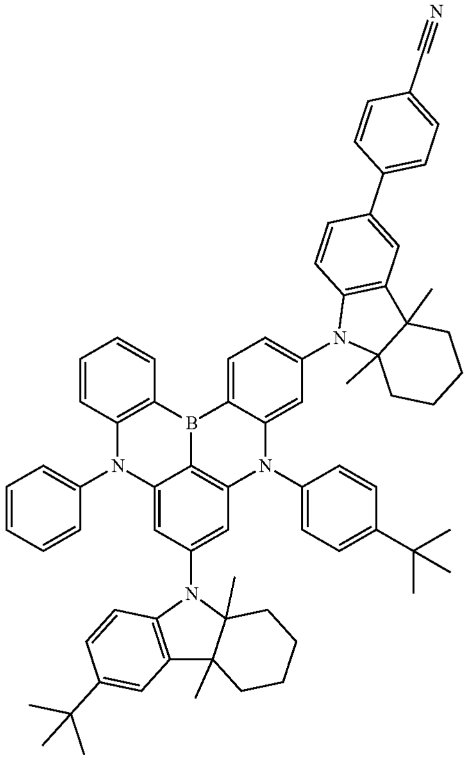

-continued
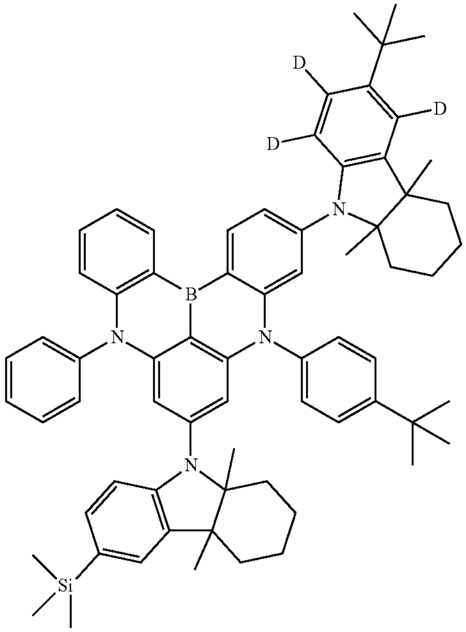
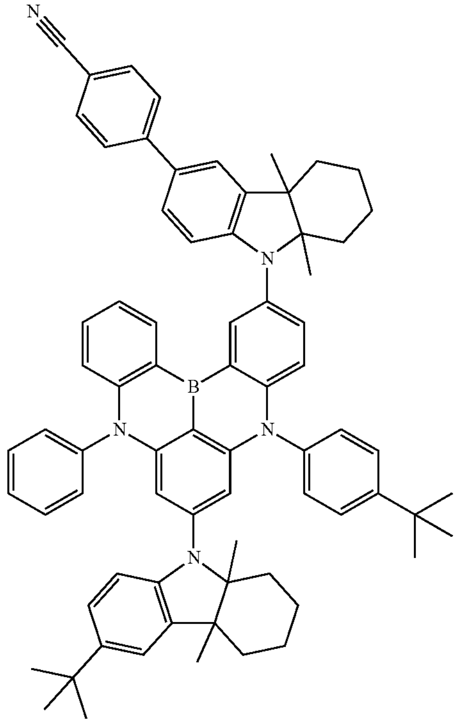
-continued
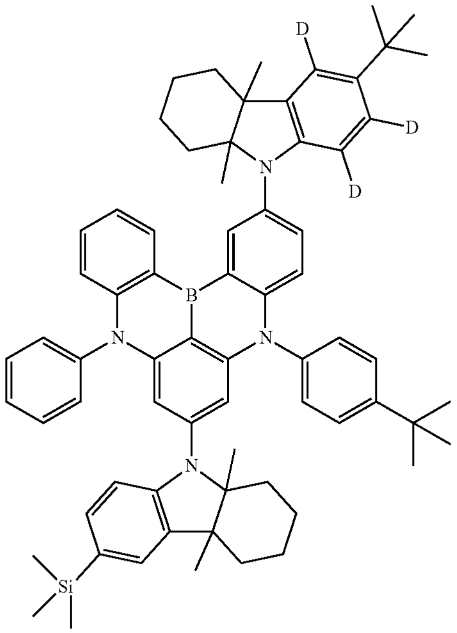
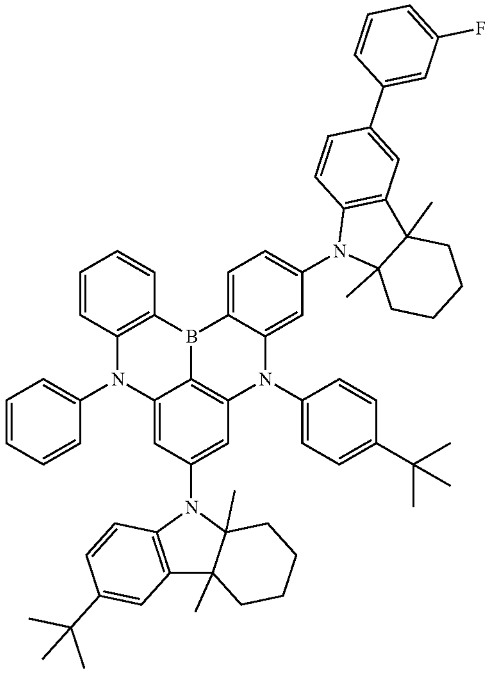

-continued
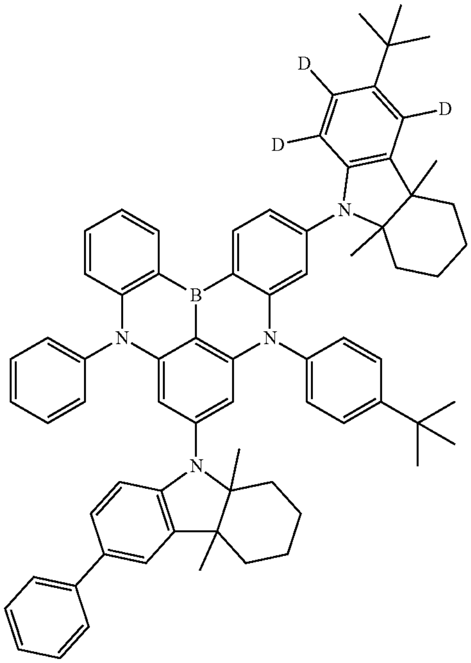
-continued
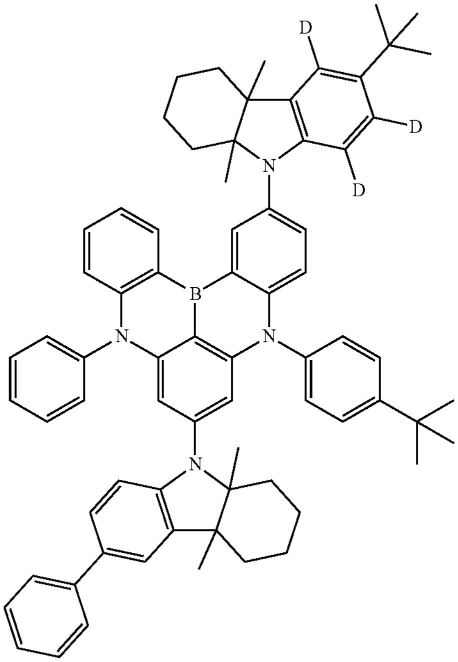
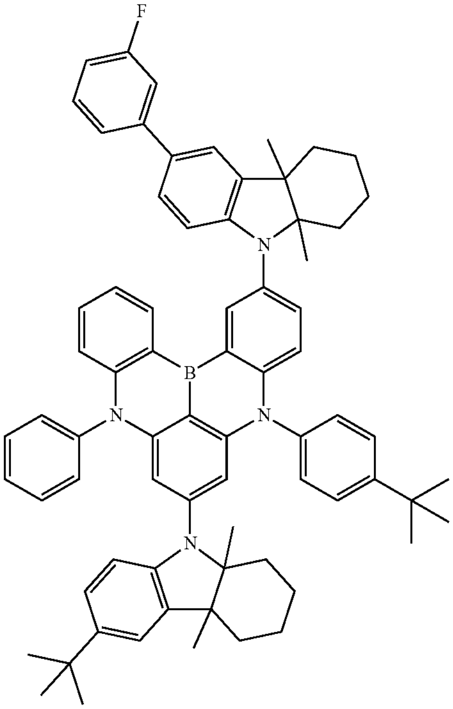
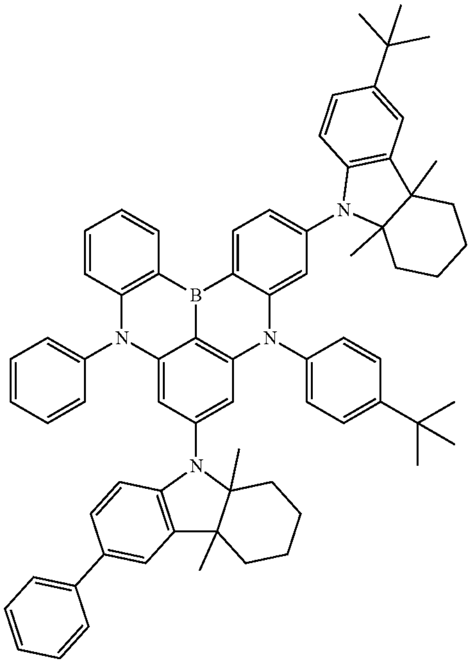

-continued
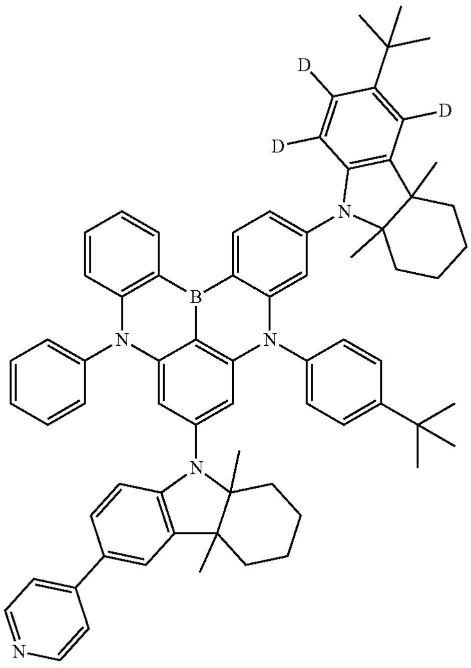
-continued
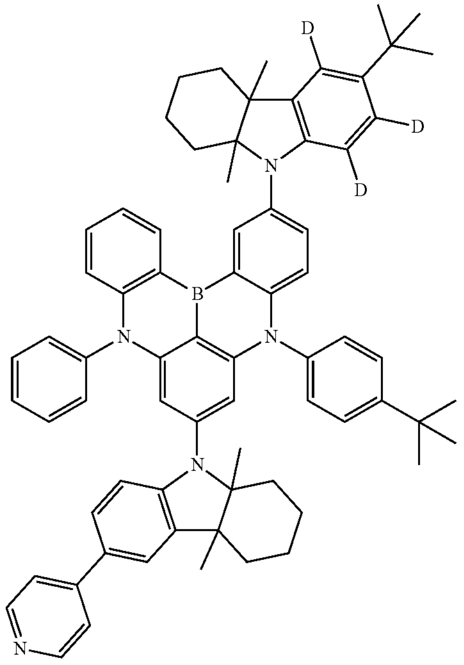
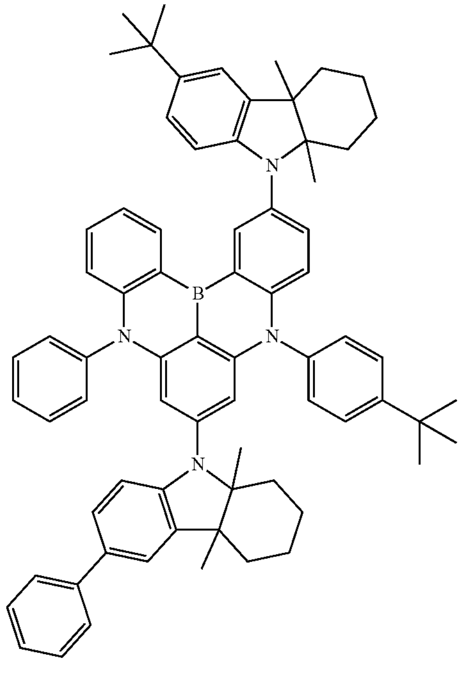
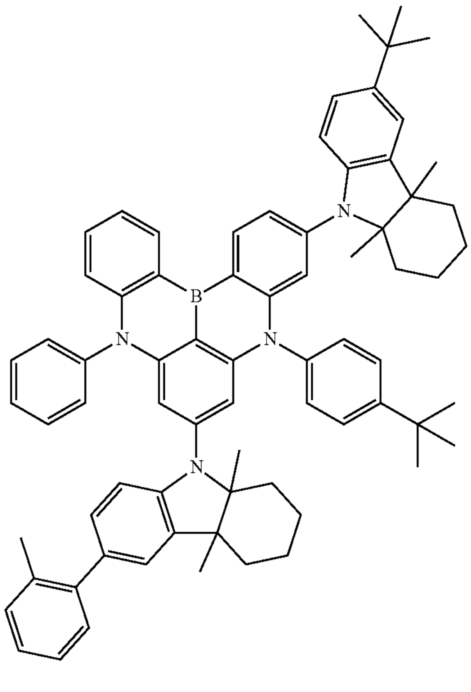

-continued
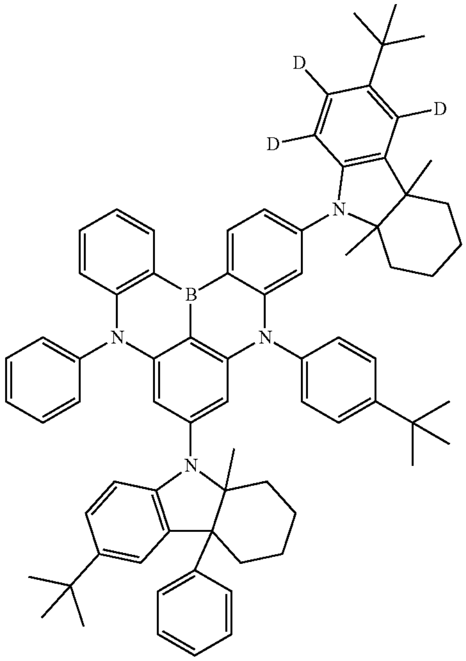
-continued
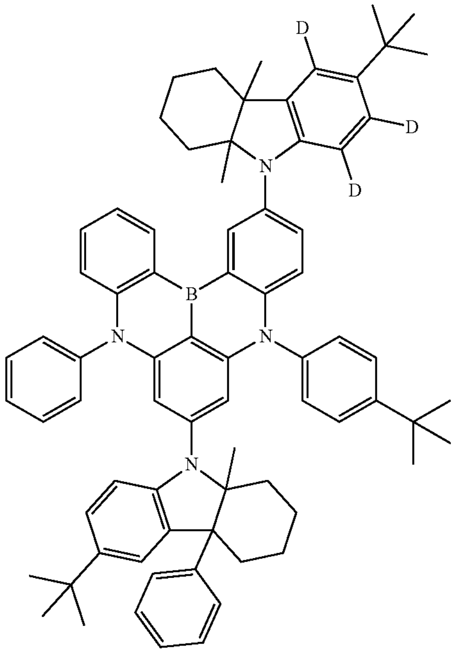
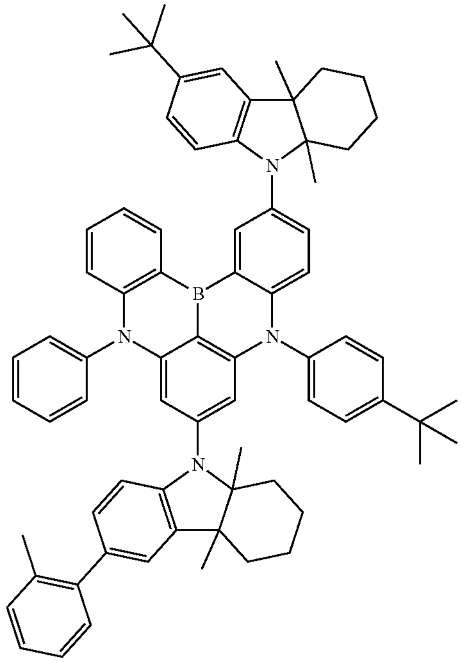
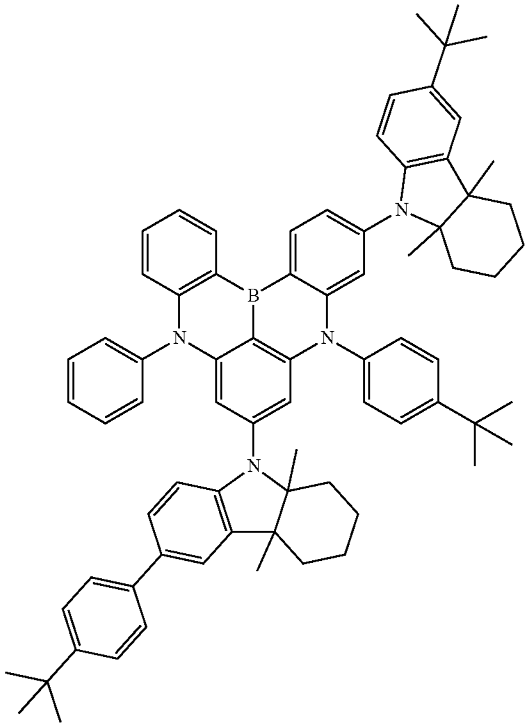

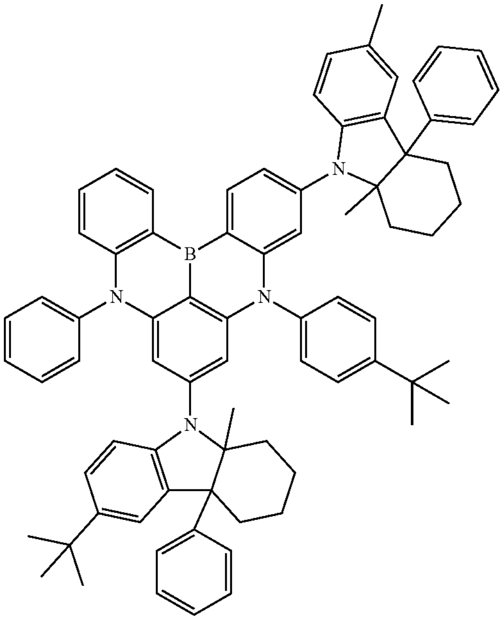
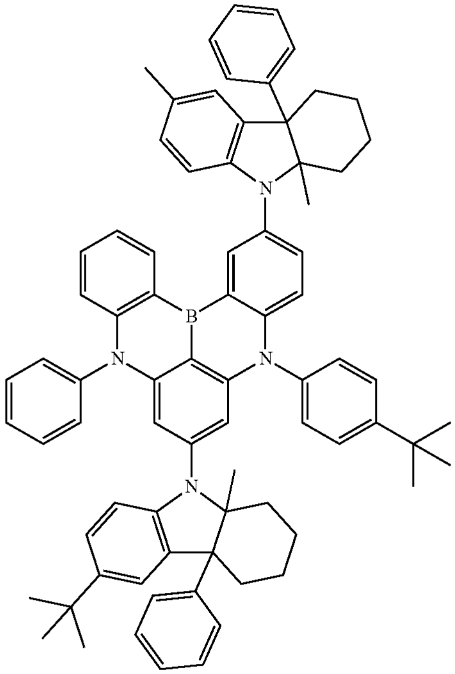
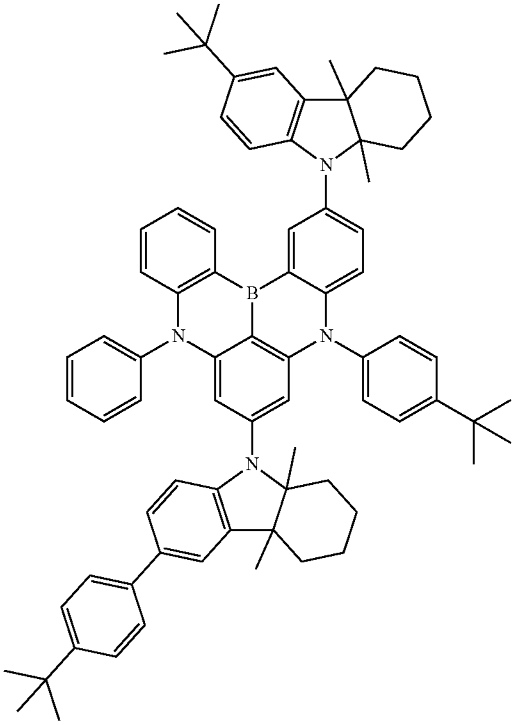
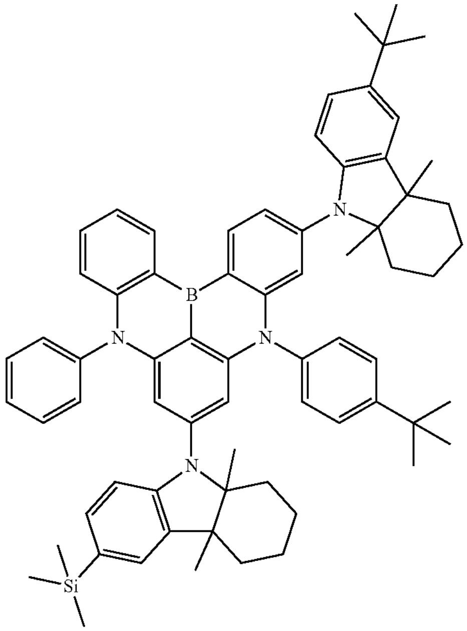

-continued
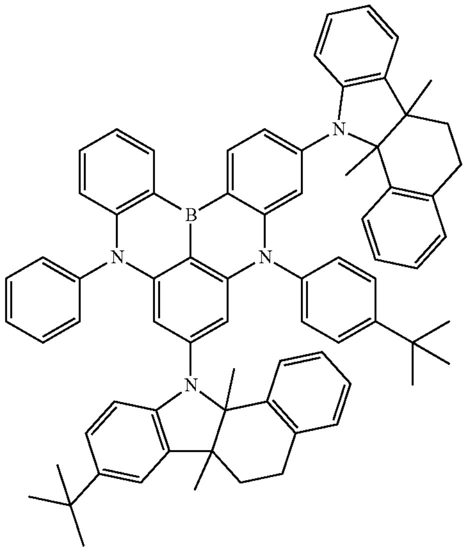
-continued
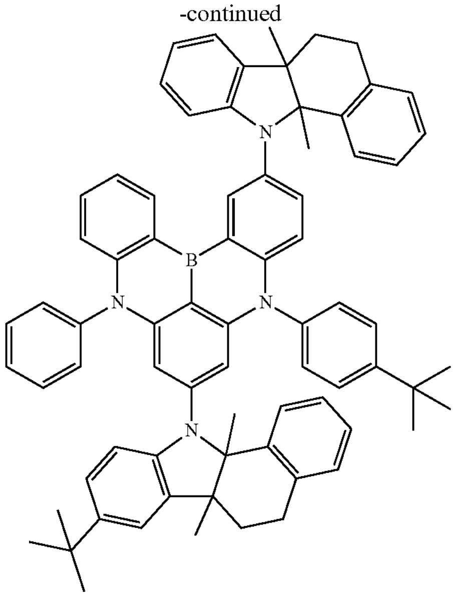
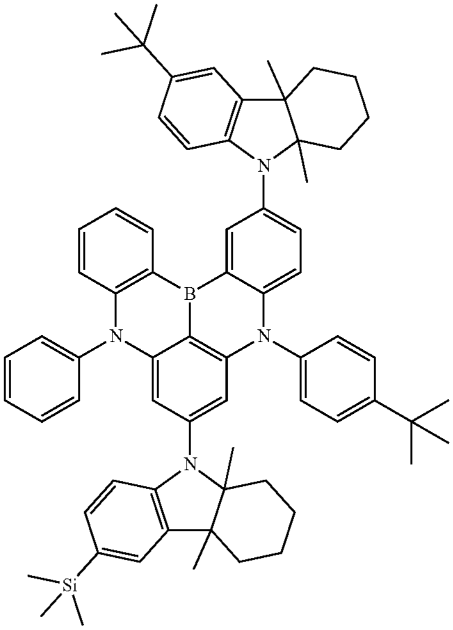
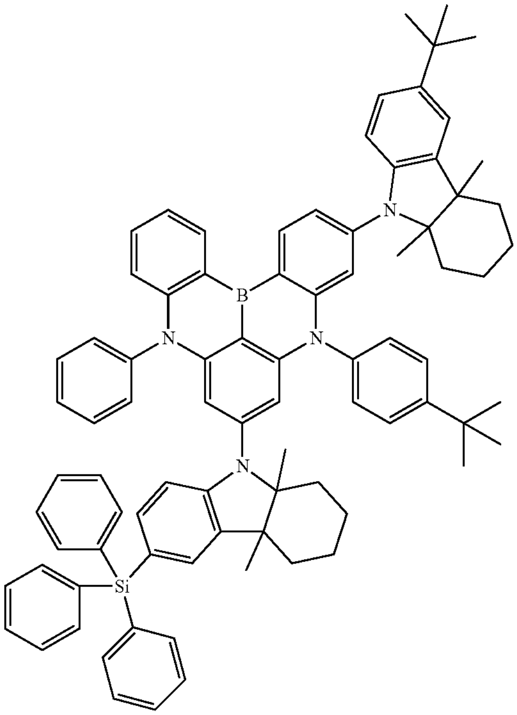

-continued
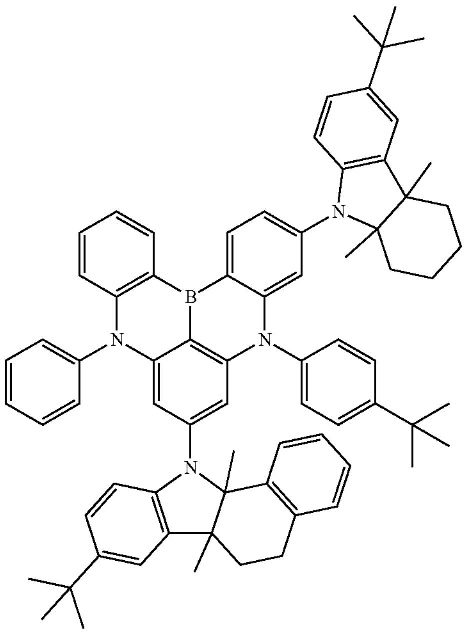
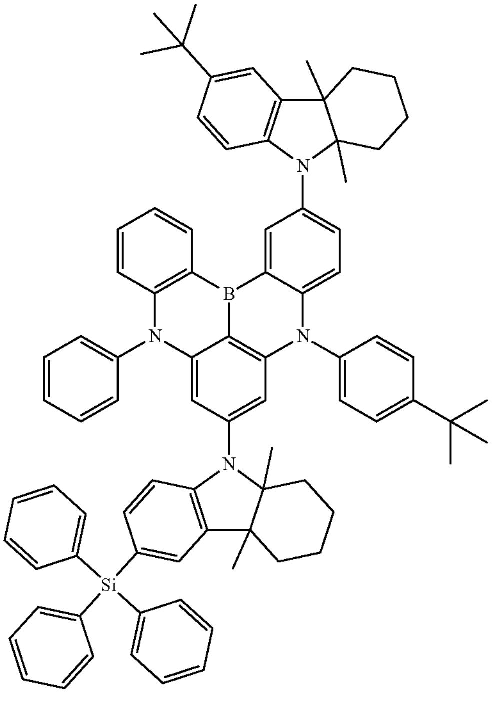
-continued
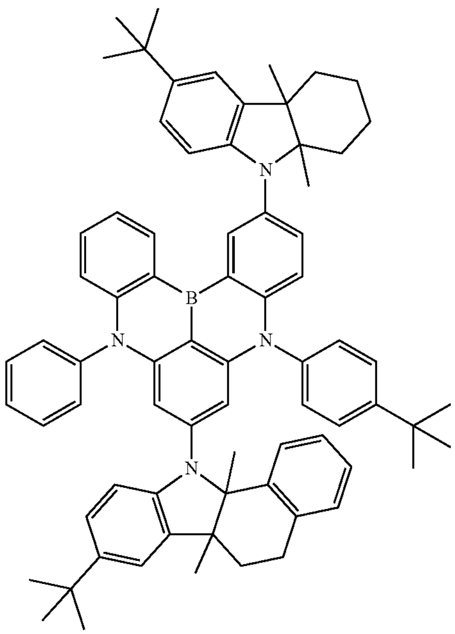
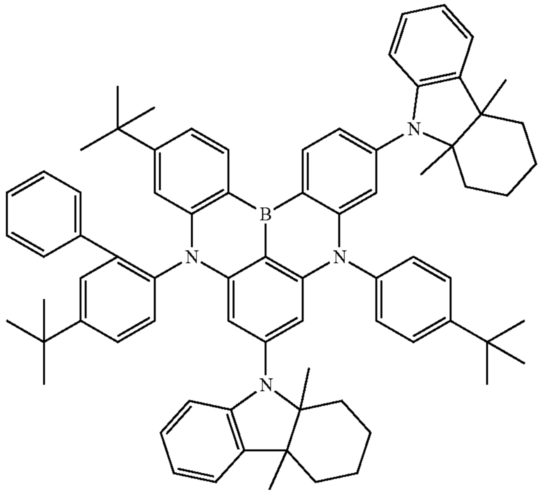
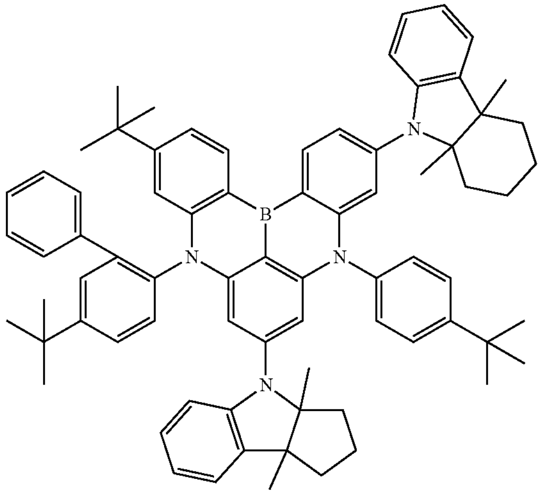

-continued
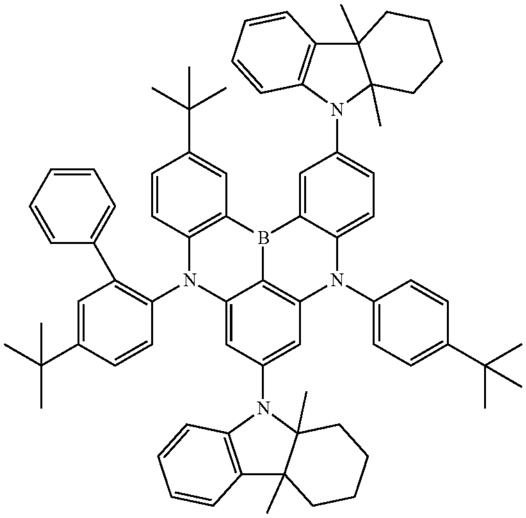
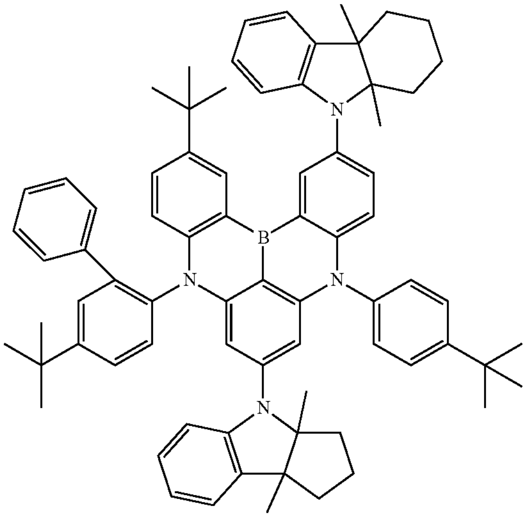
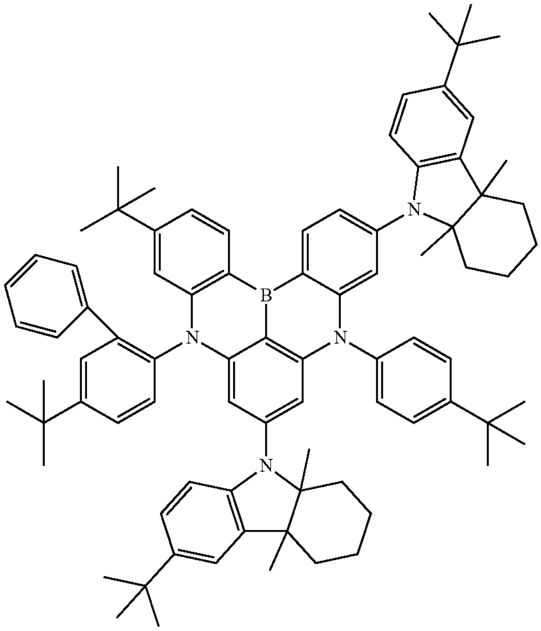
-continued
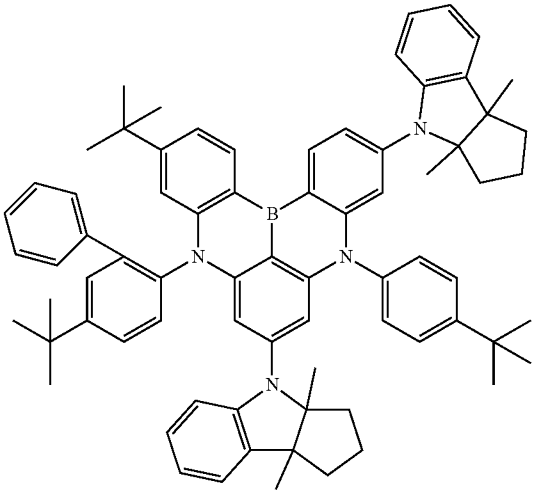
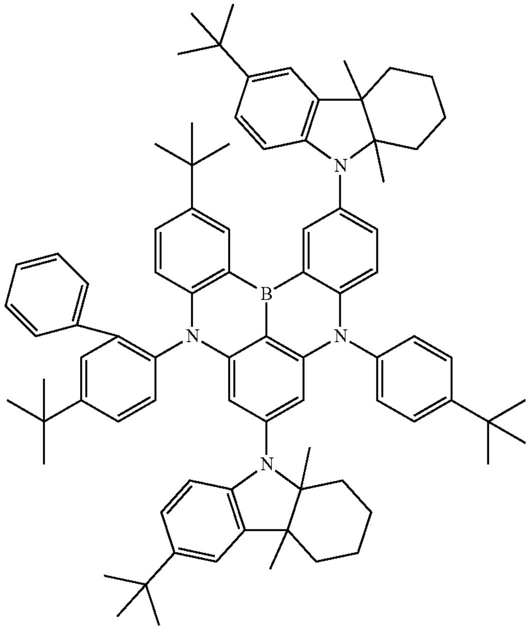
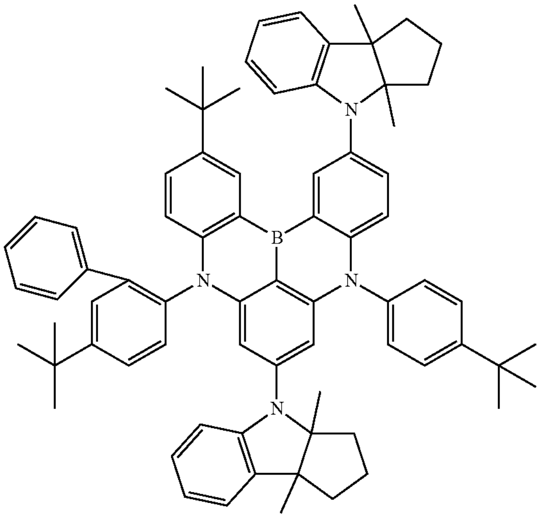

-continued
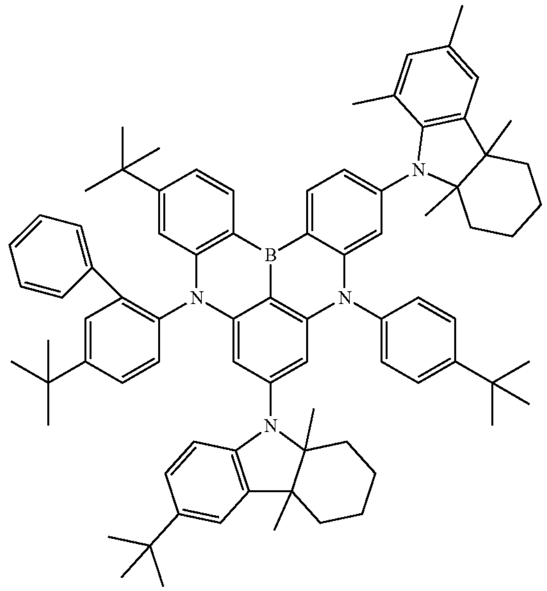
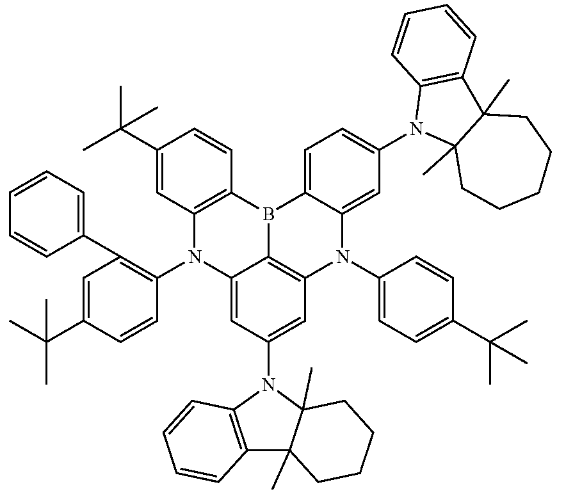
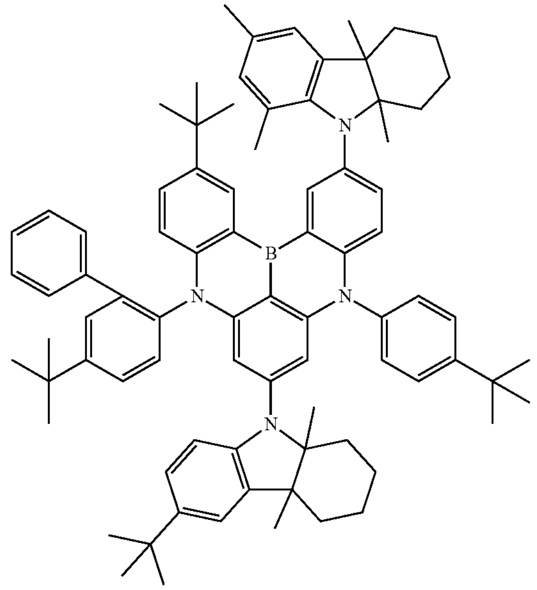
-continued
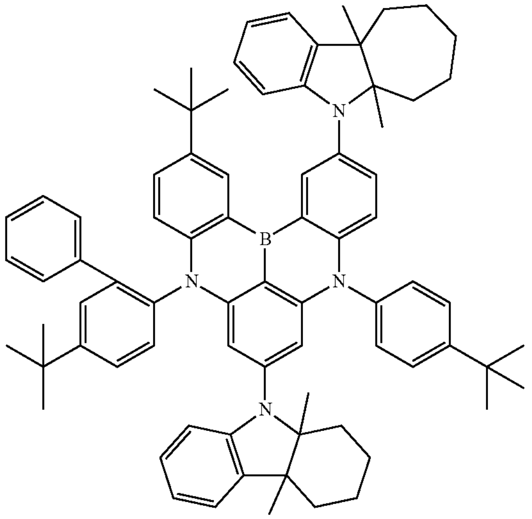
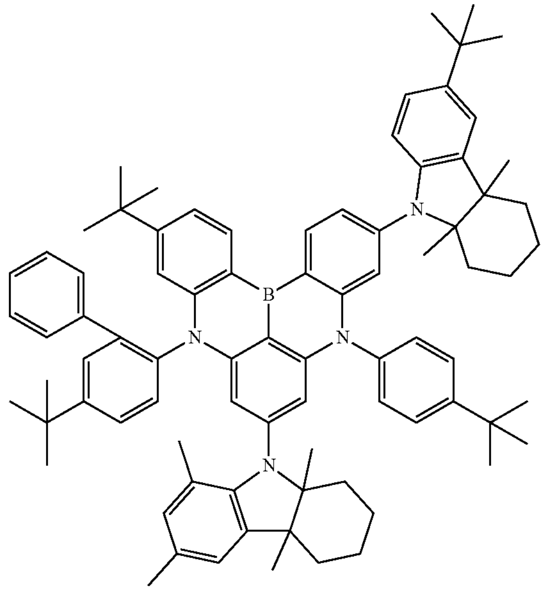
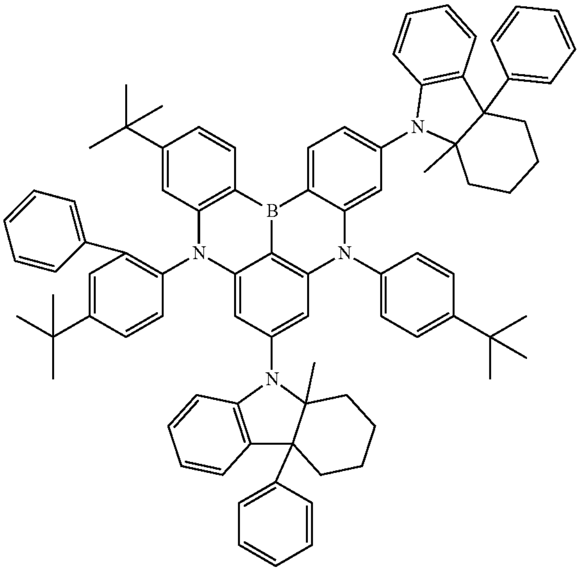

-continued
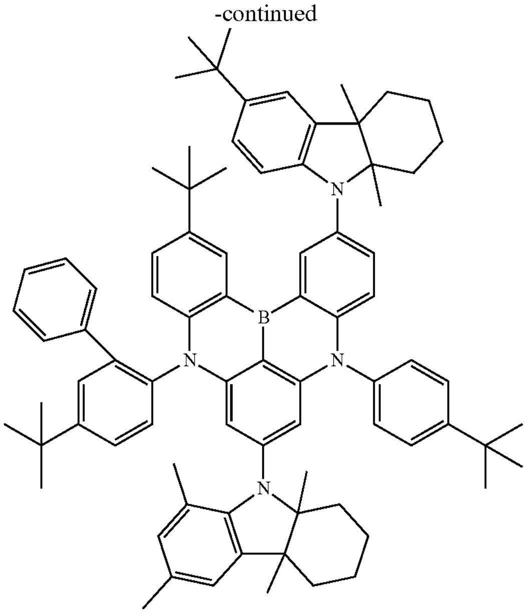
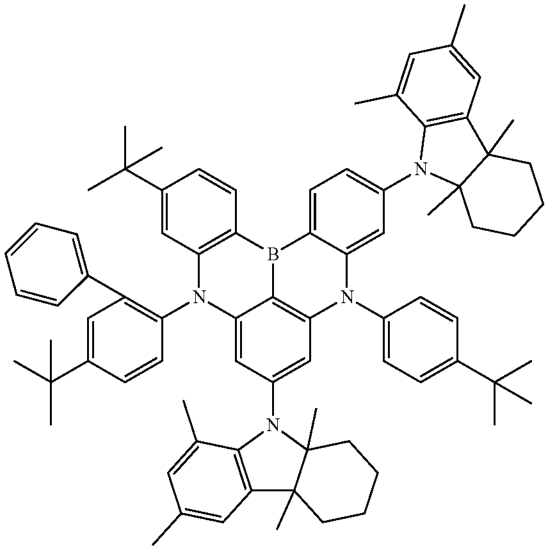
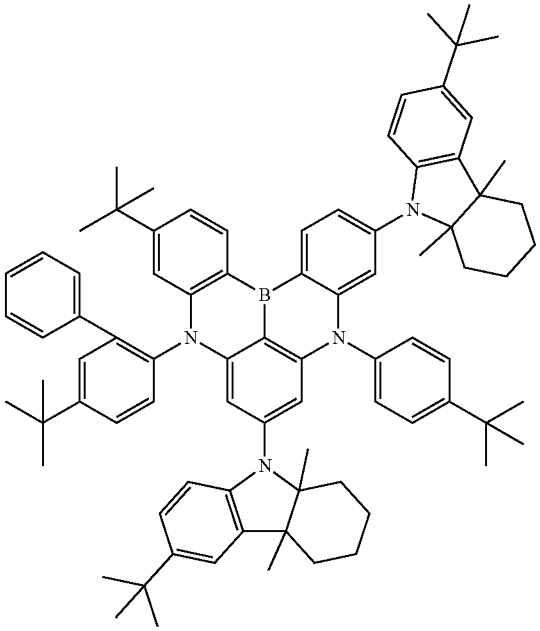
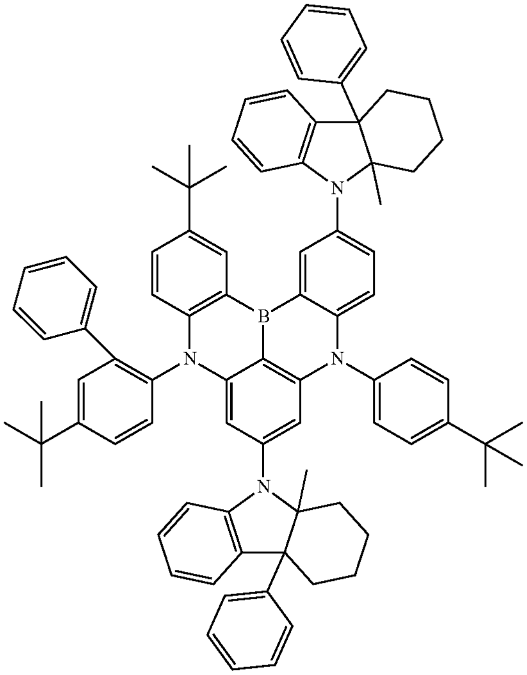 [SMILES: CC(C)(C)c1ccc(N2c3ccc(N4c5ccccc5C5(c6ccccc6)CCCCC45C)cc3B3c4cc(C(C)(C)C)ccc4N(c4ccc(C(C)(C)C)cc4-c4ccccc4)c4cc(N5c6ccccc6C6(c7ccccc7)CCCCC56C)cc2c43)cc1]
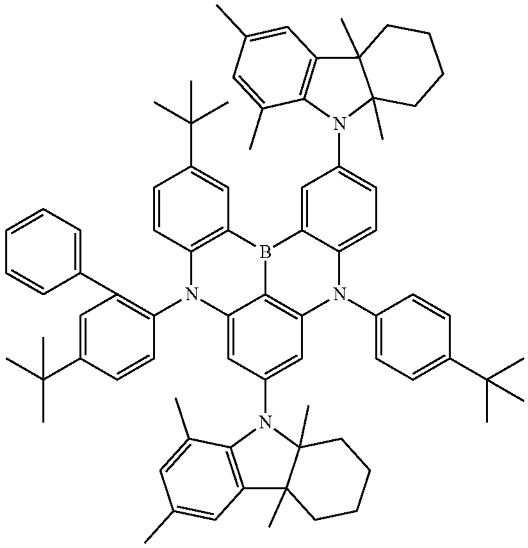

-continued
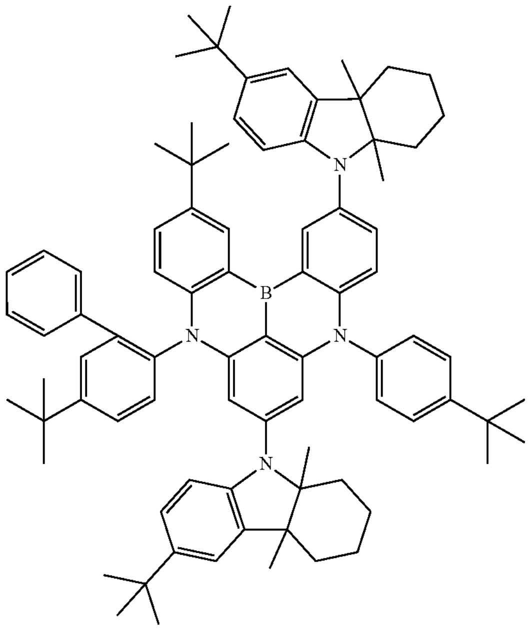
-continued
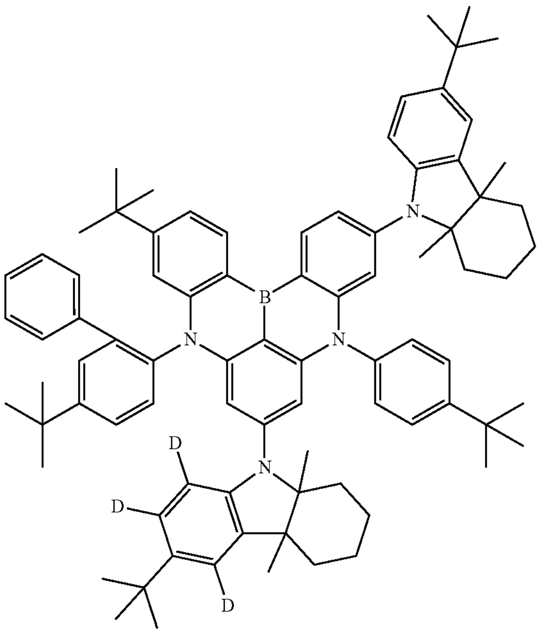
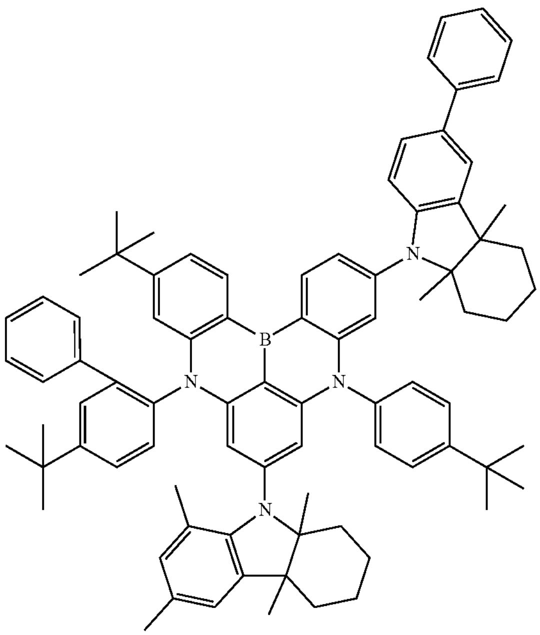
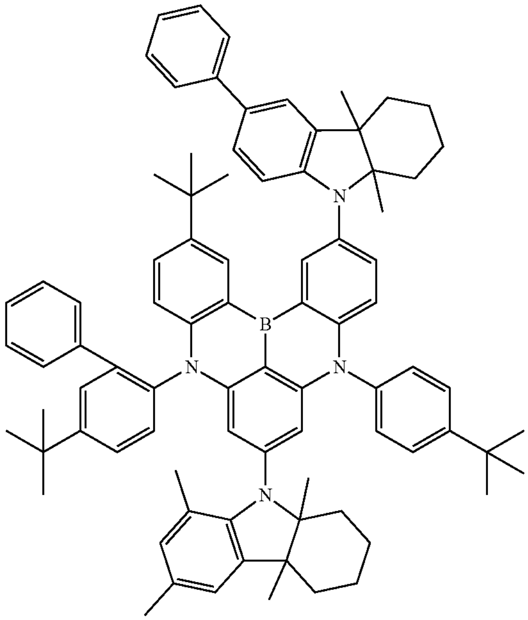

-continued
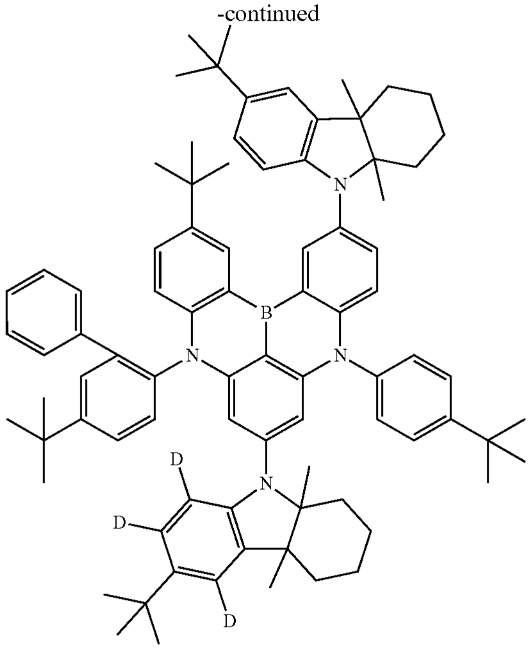
-continued
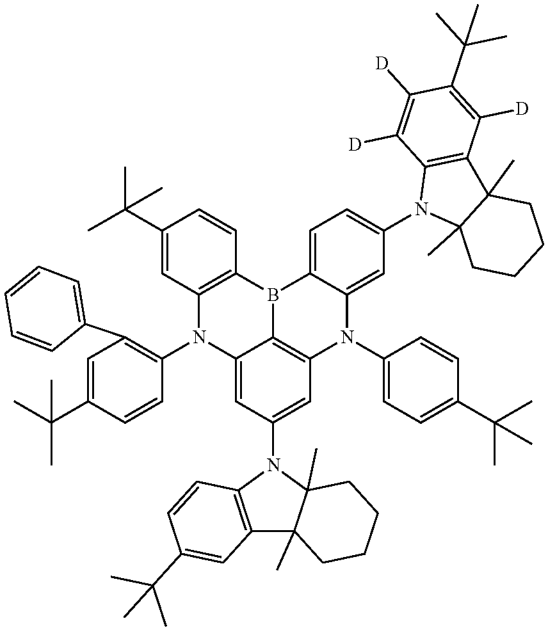
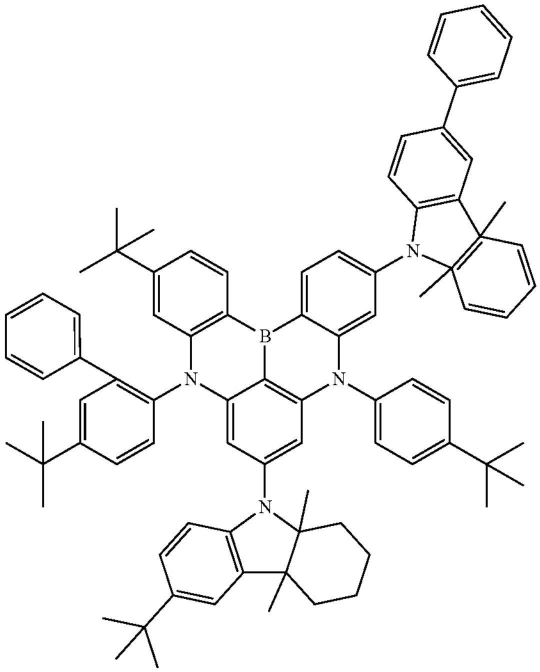
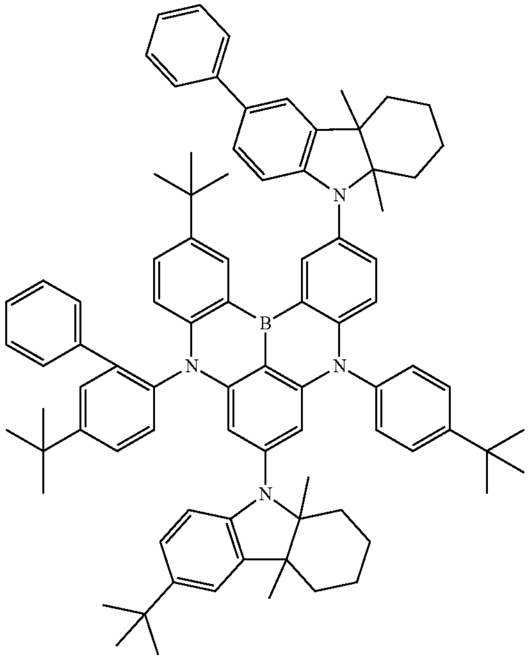

-continued
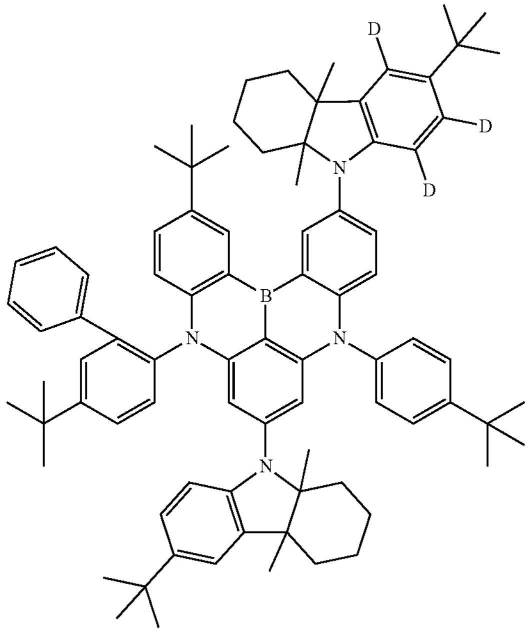
-continued
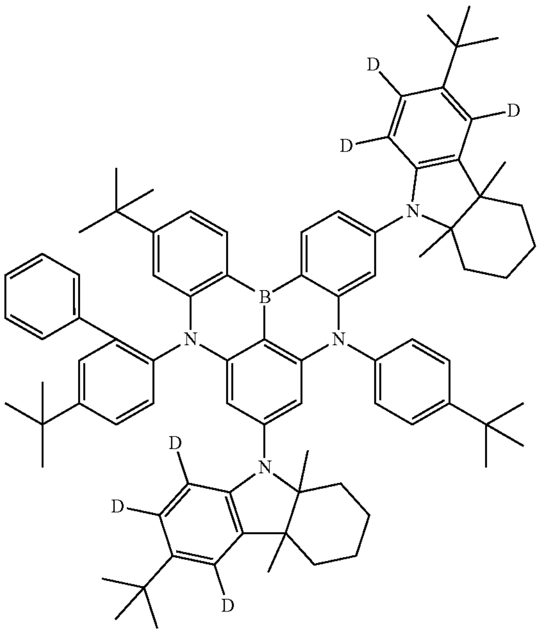
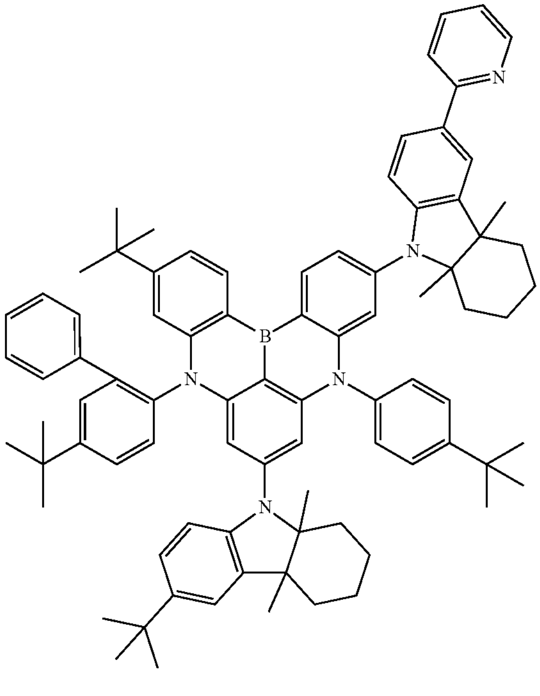
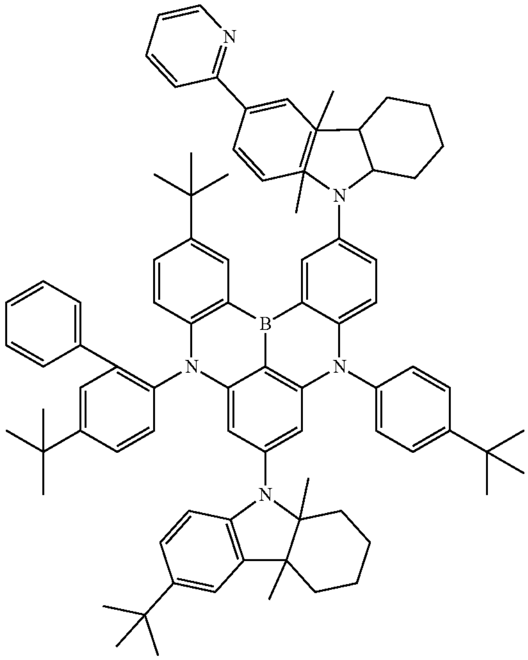

-continued
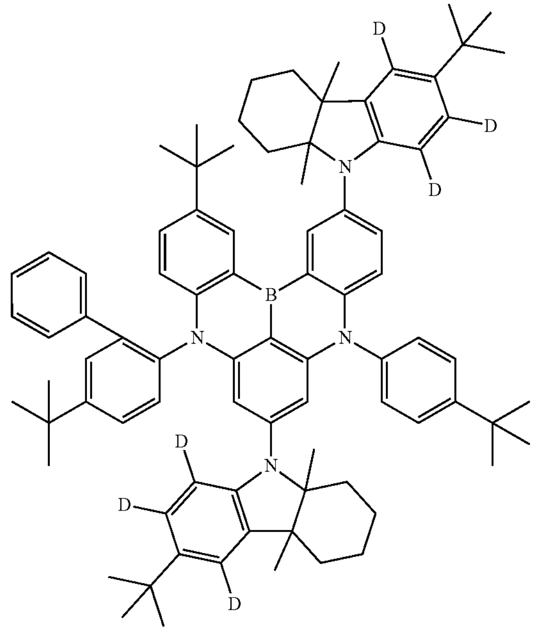
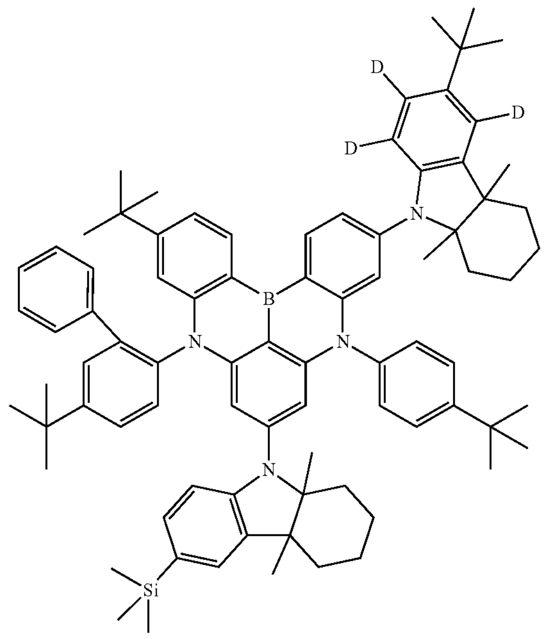
-continued
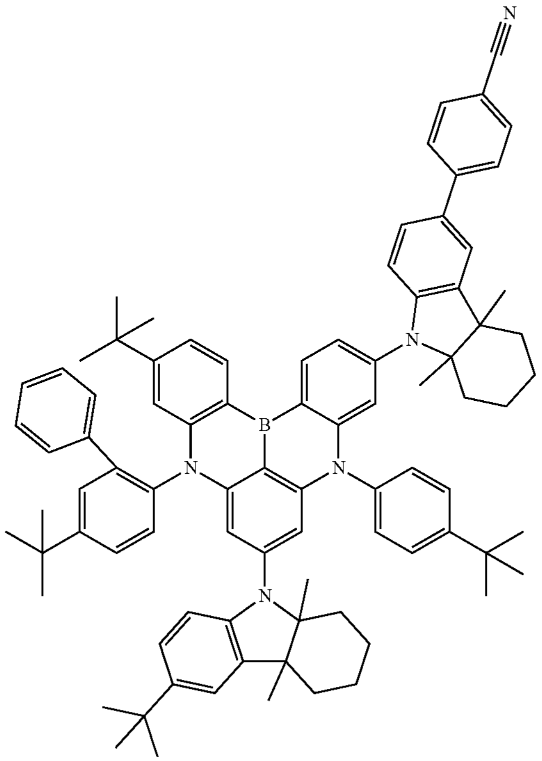
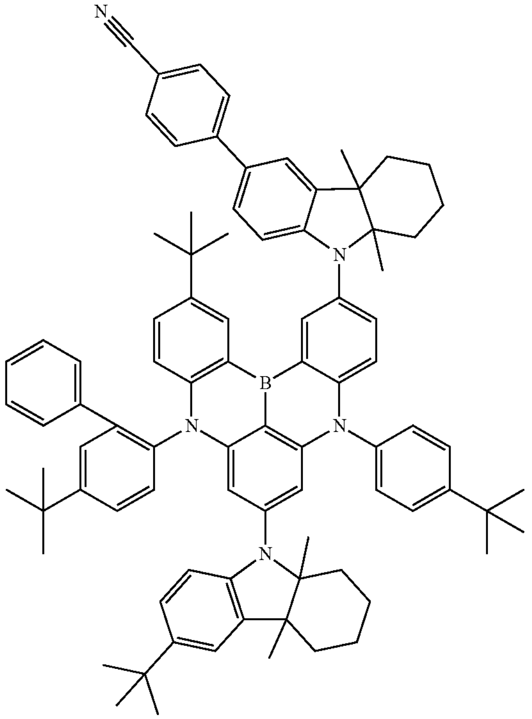

-continued
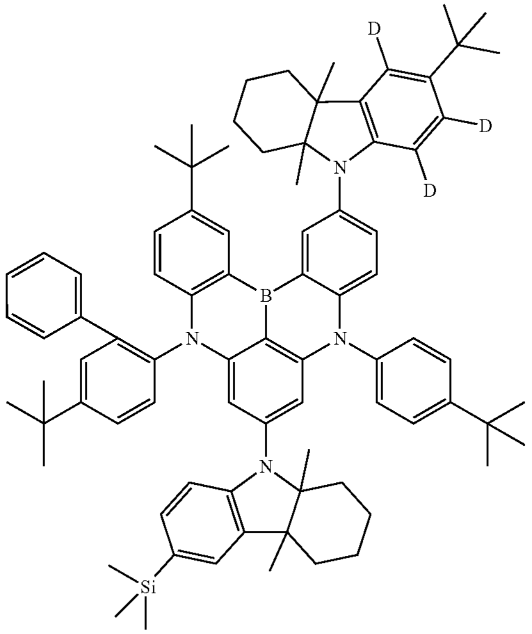
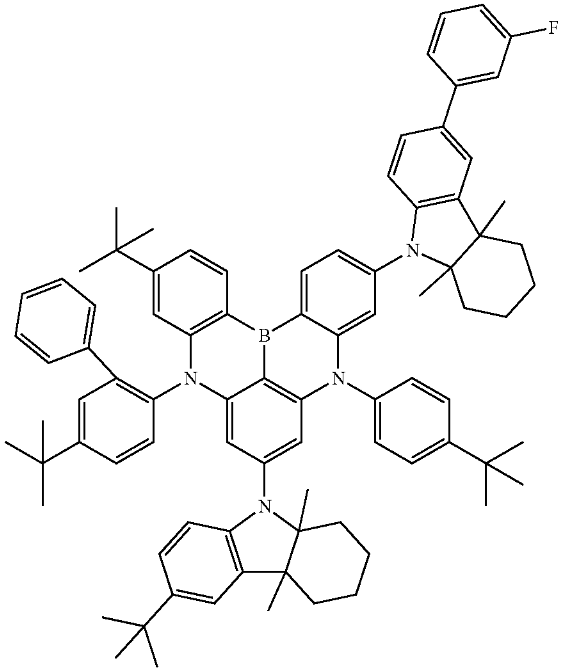
-continued
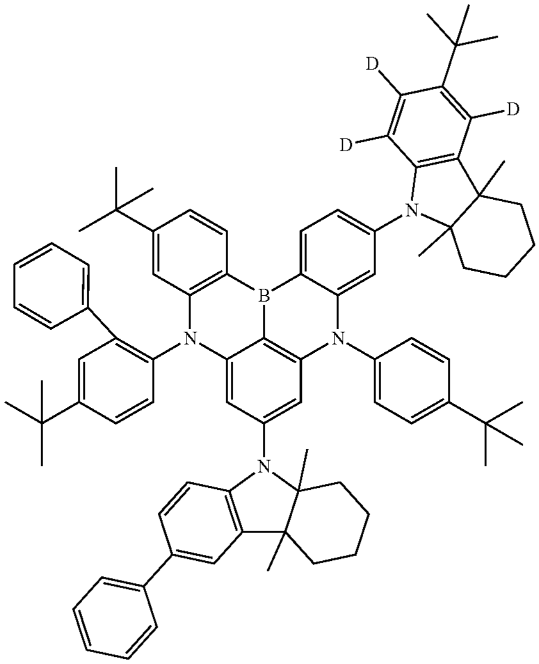
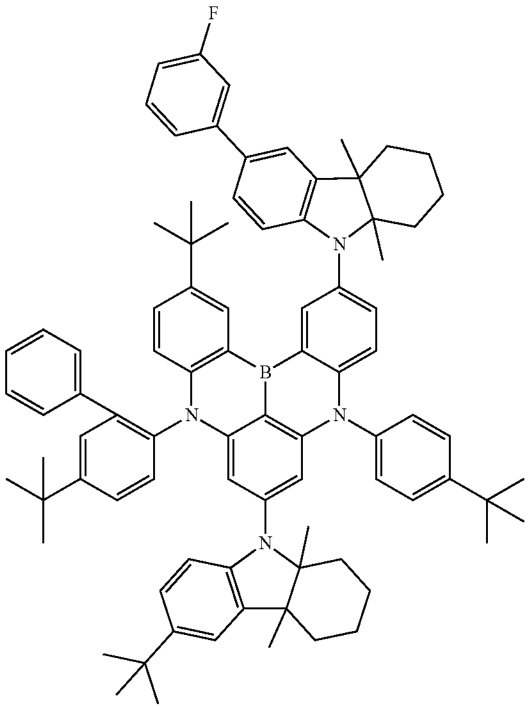

-continued
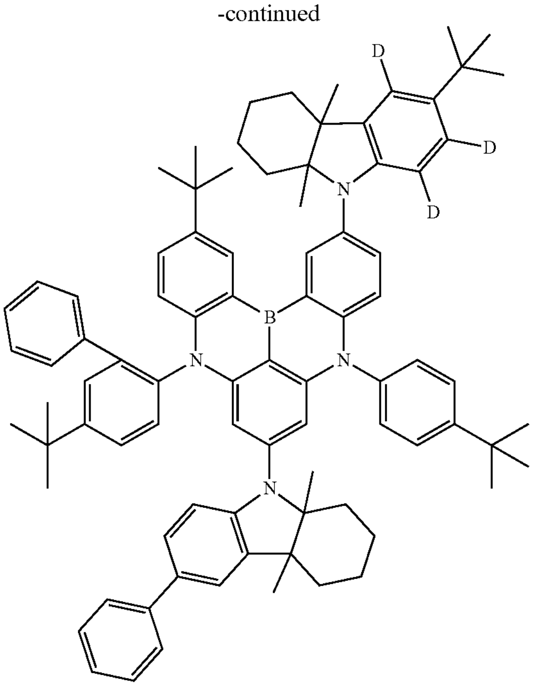
-continued
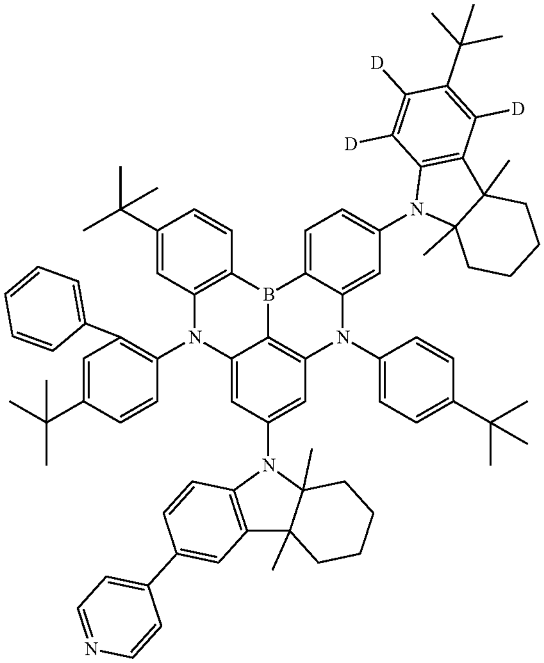
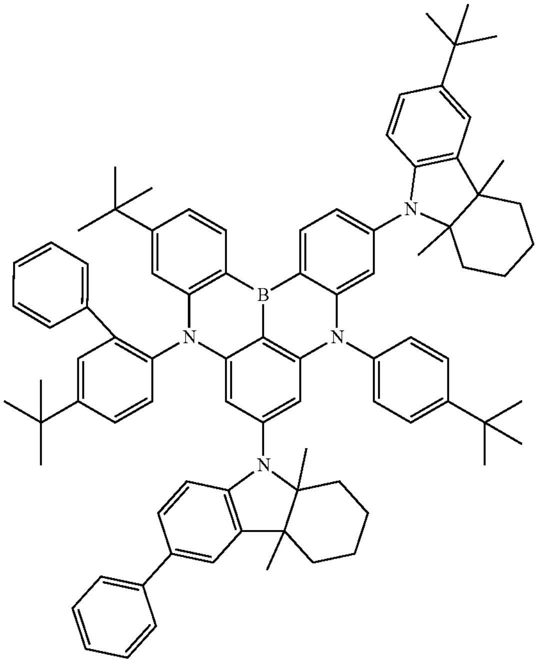
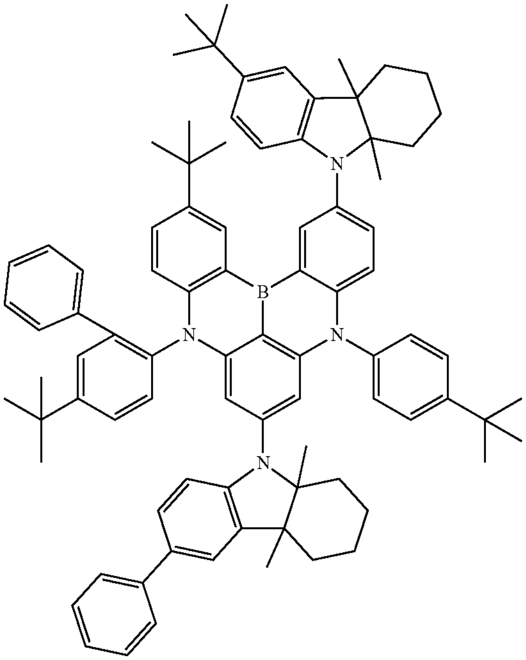

-continued
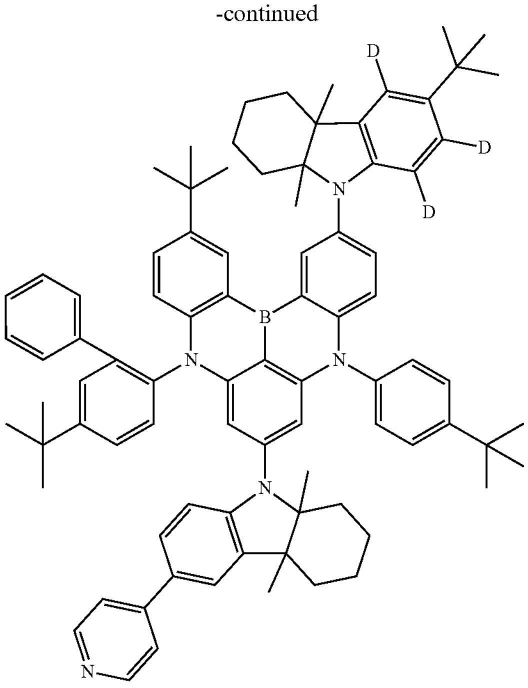
-continued
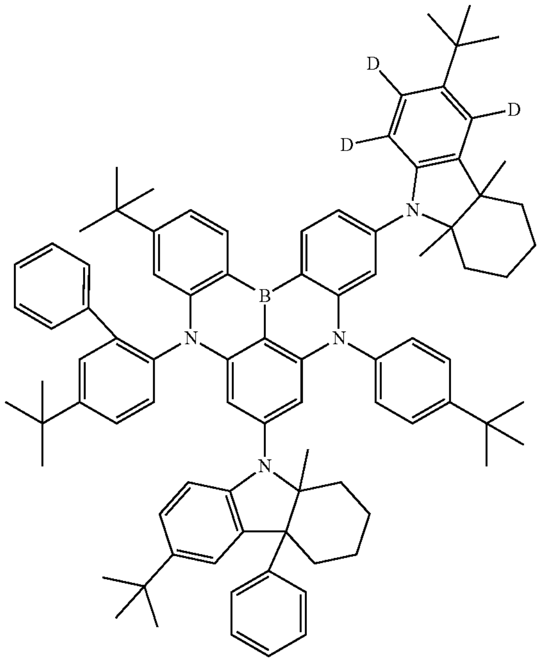
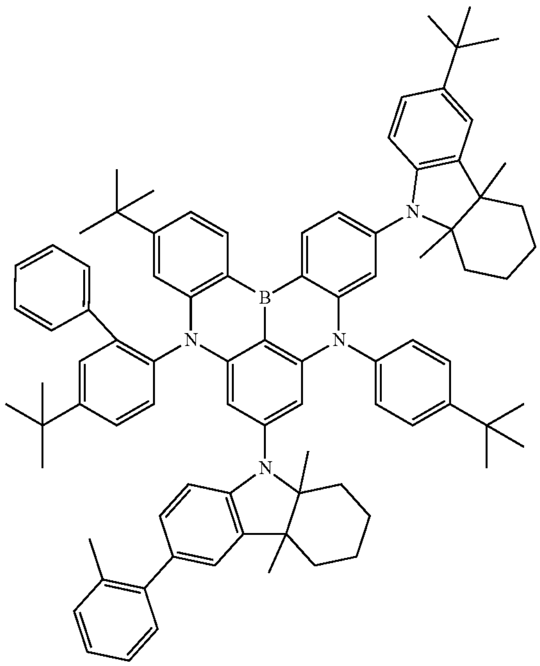
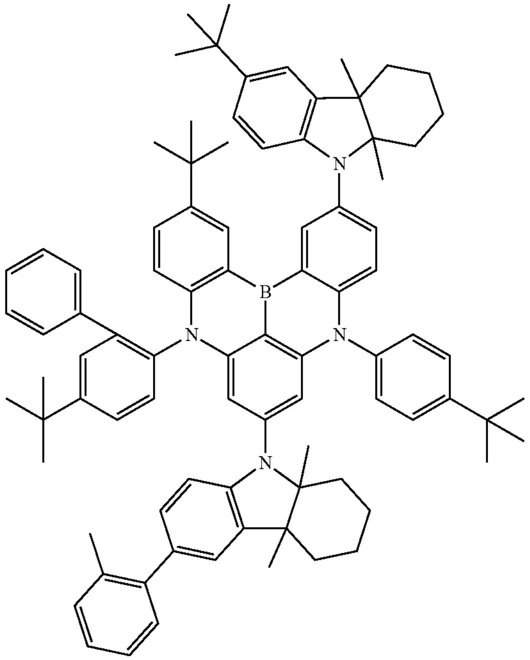

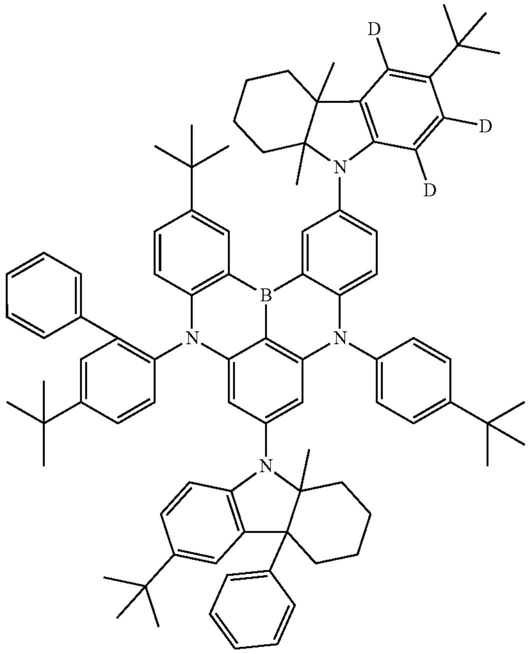
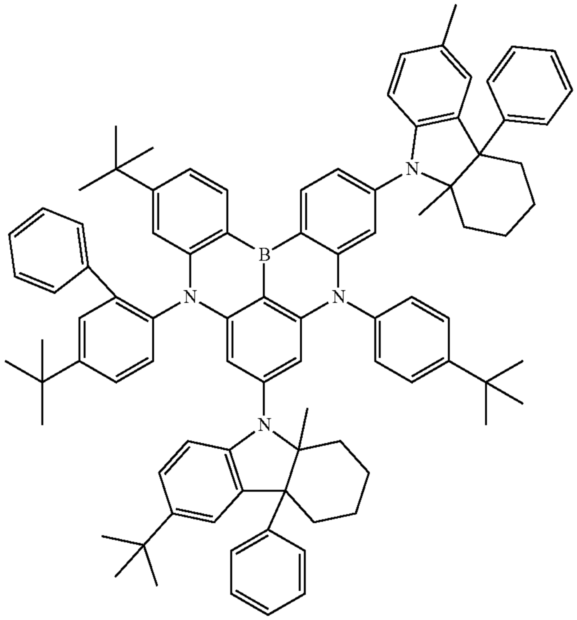
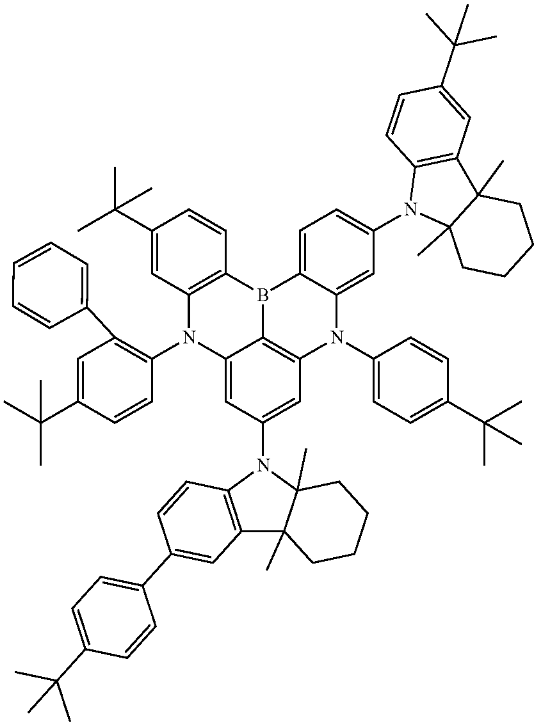
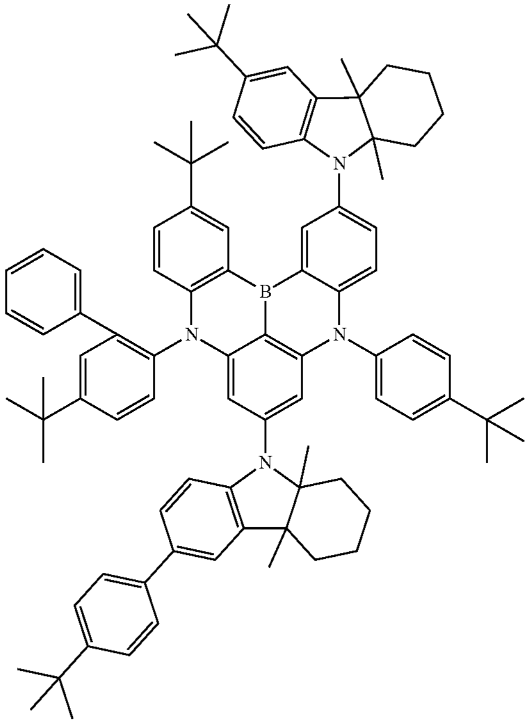

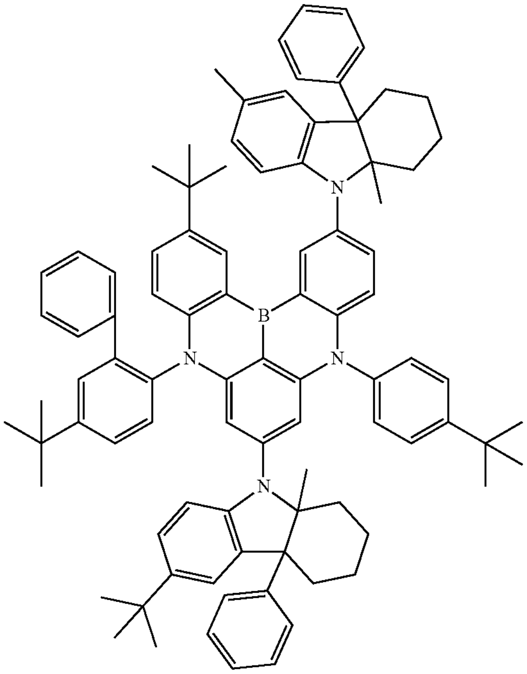
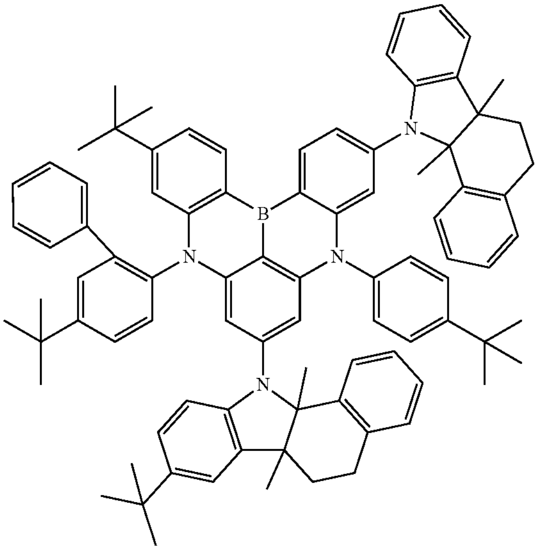
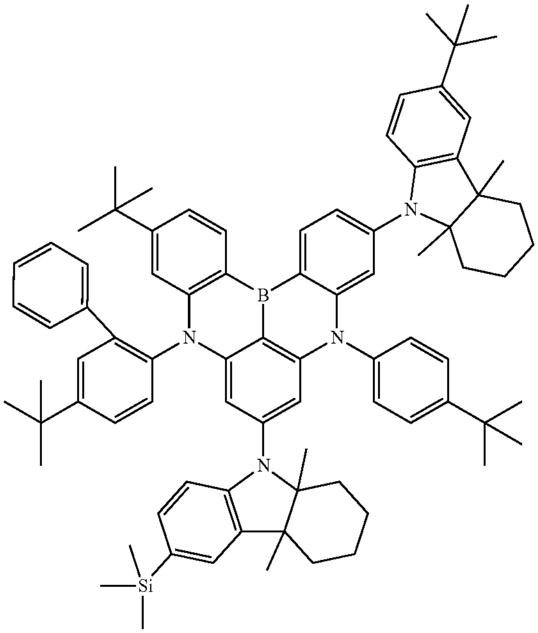
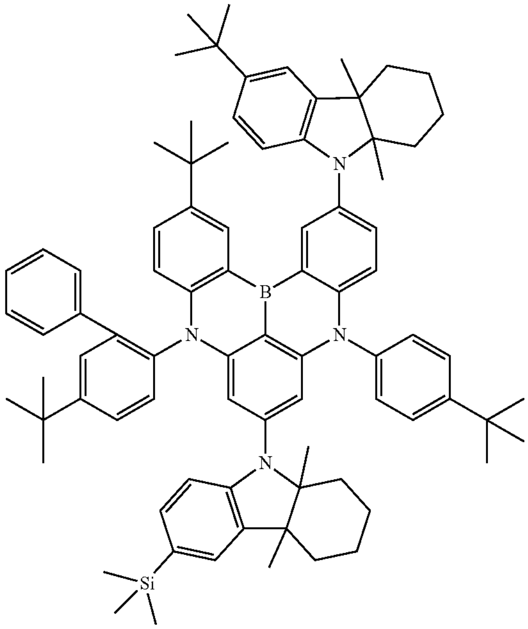

-continued
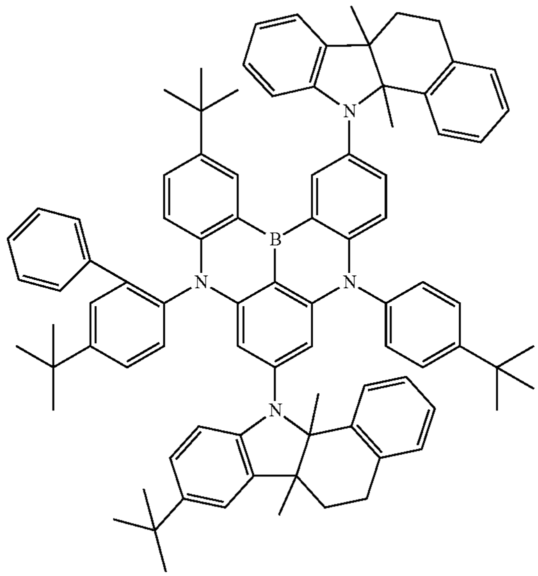
-continued
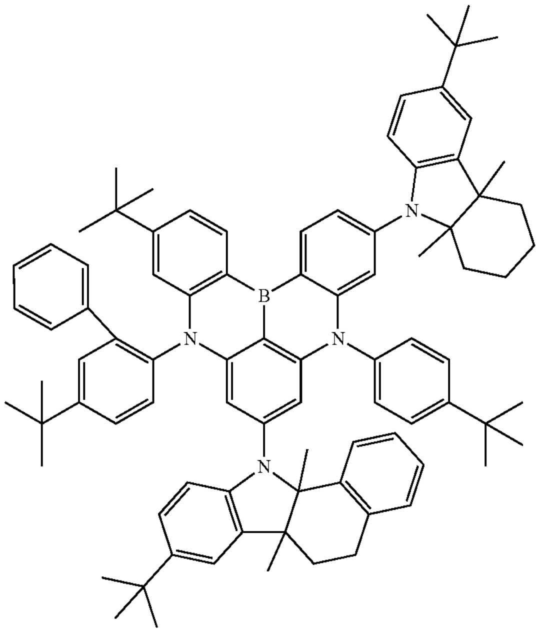
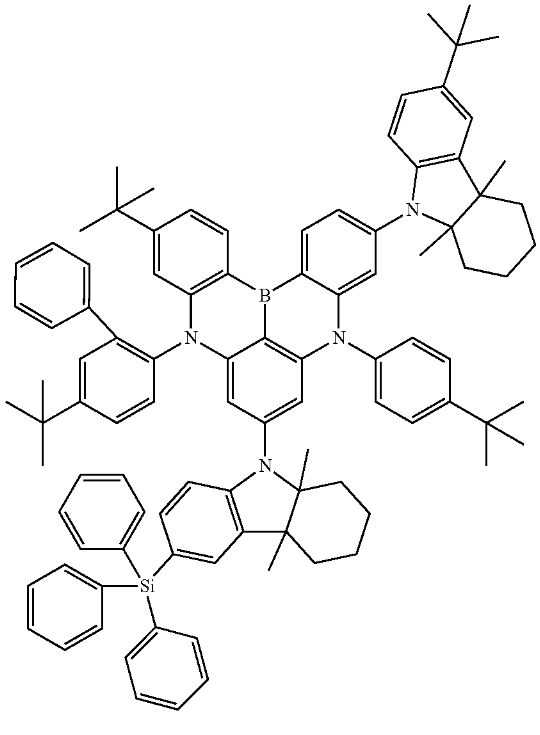
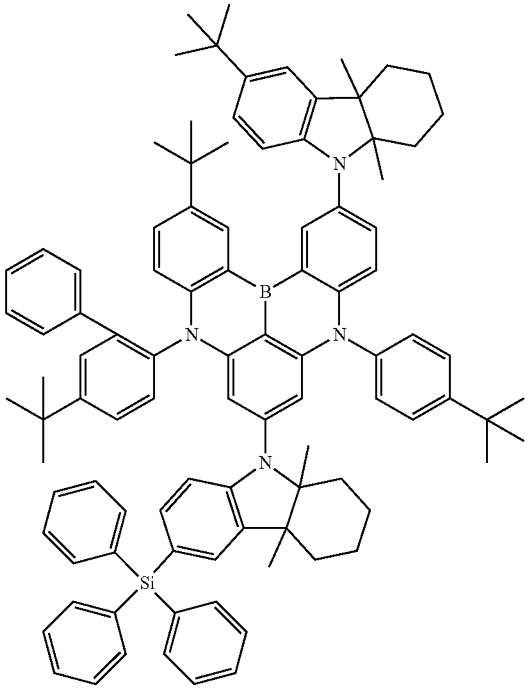

-continued
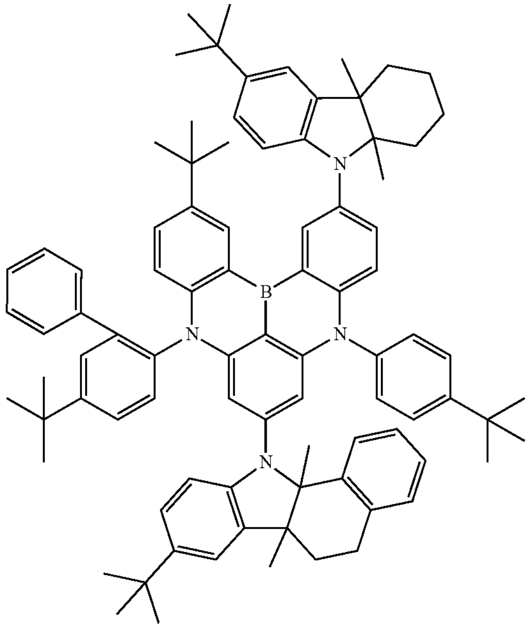
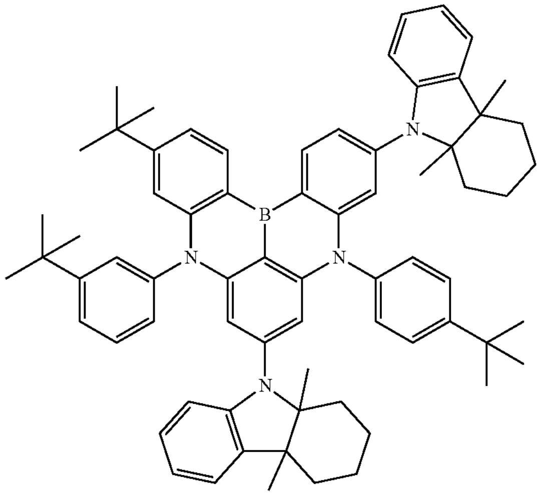
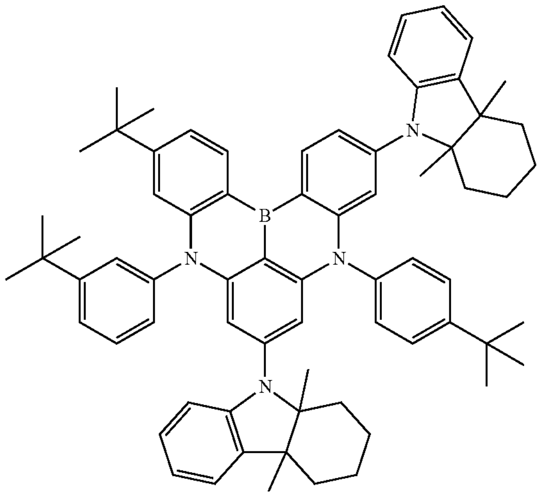
-continued
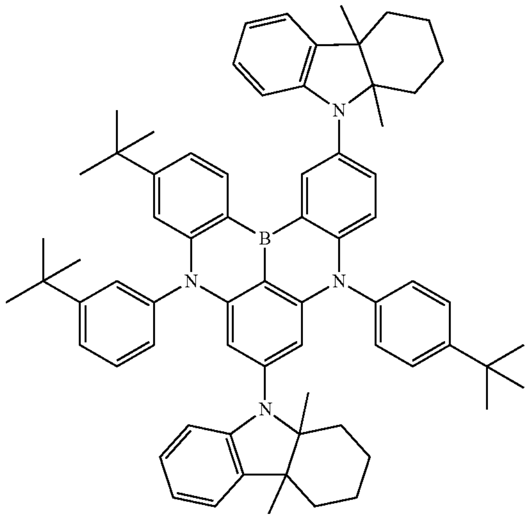
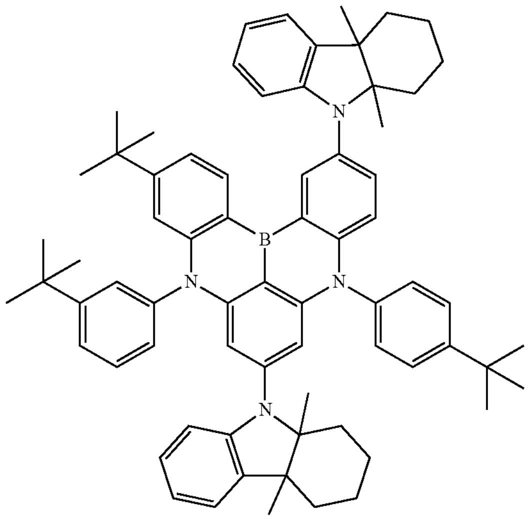
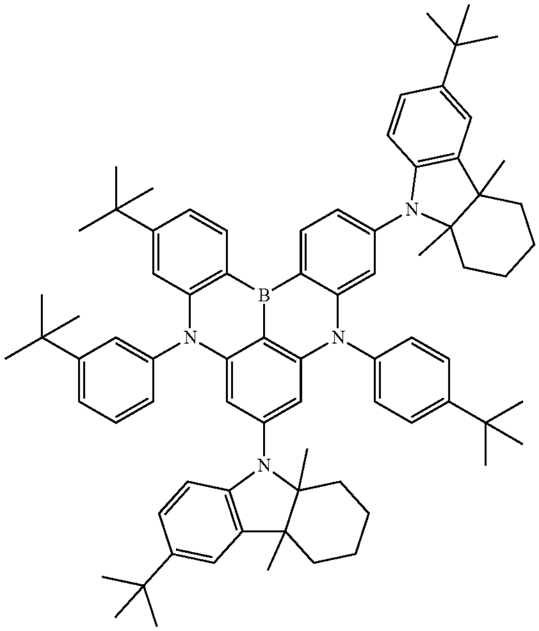

-continued
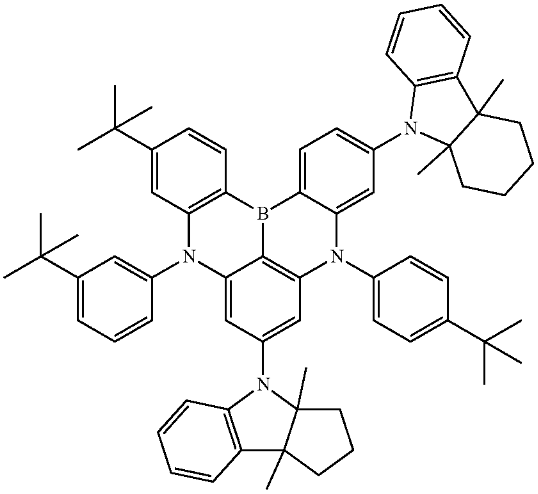
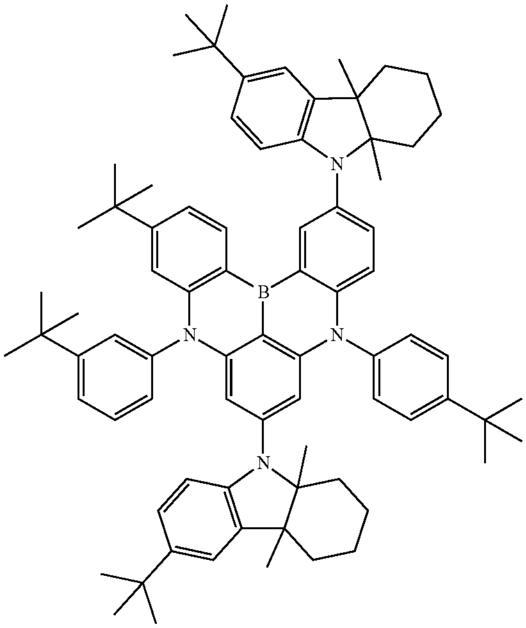
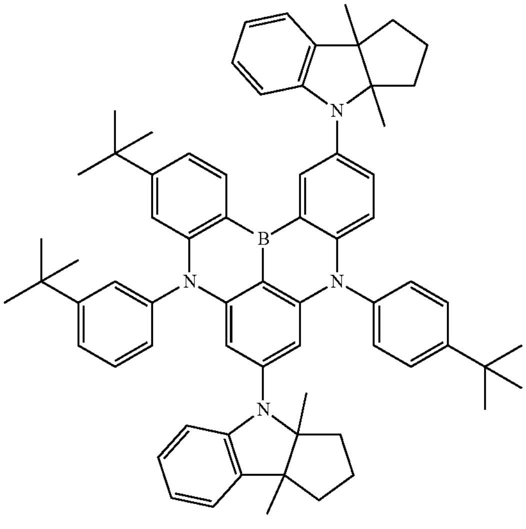
-continued
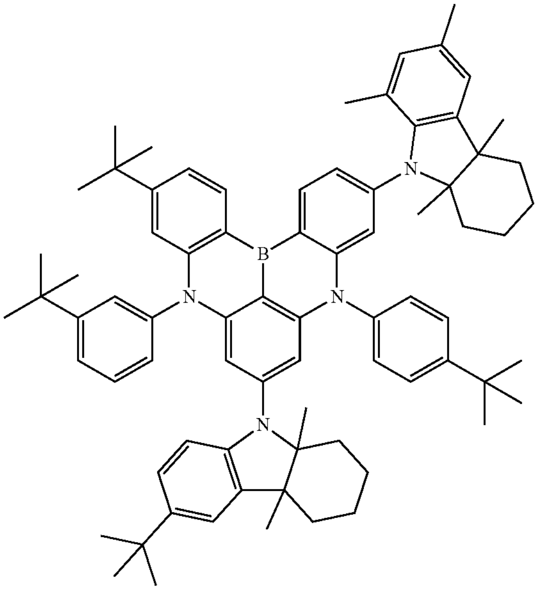
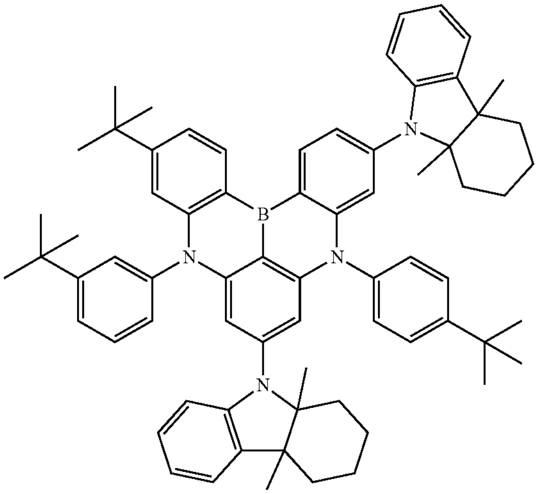
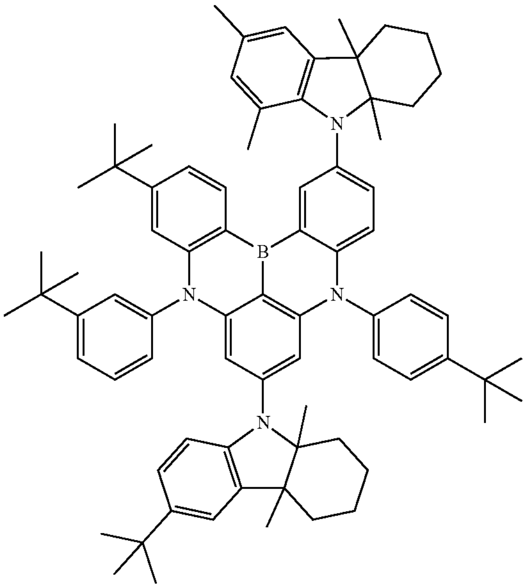

-continued
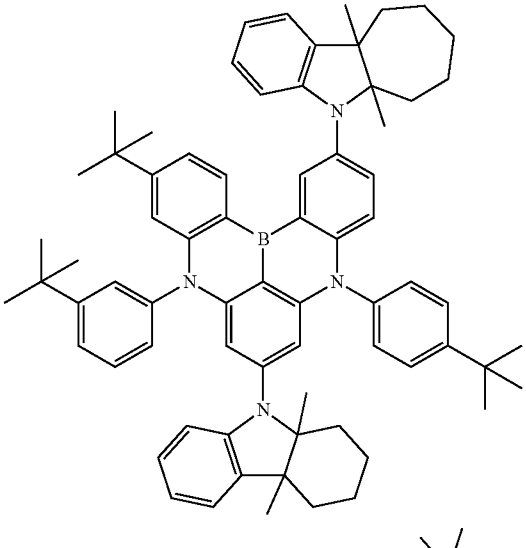
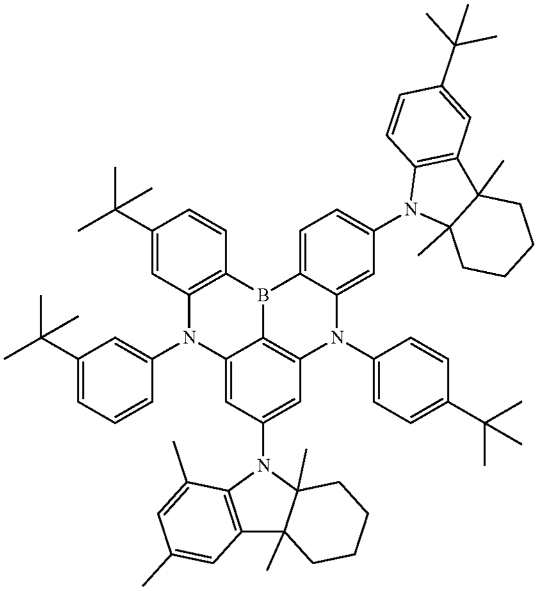
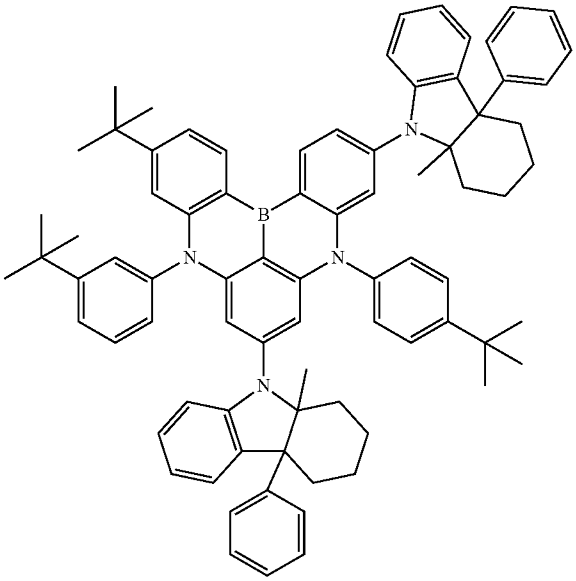
-continued
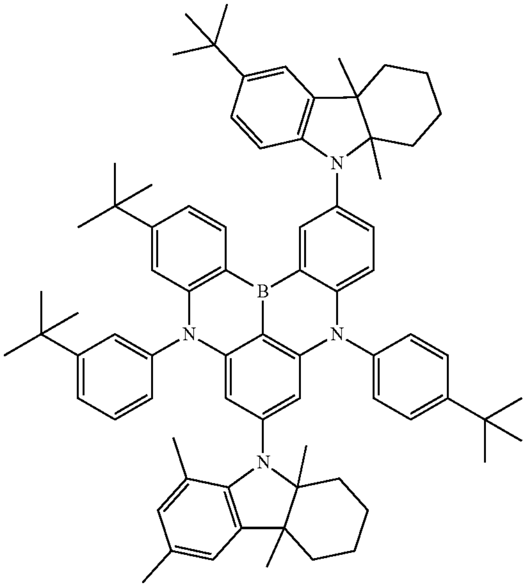
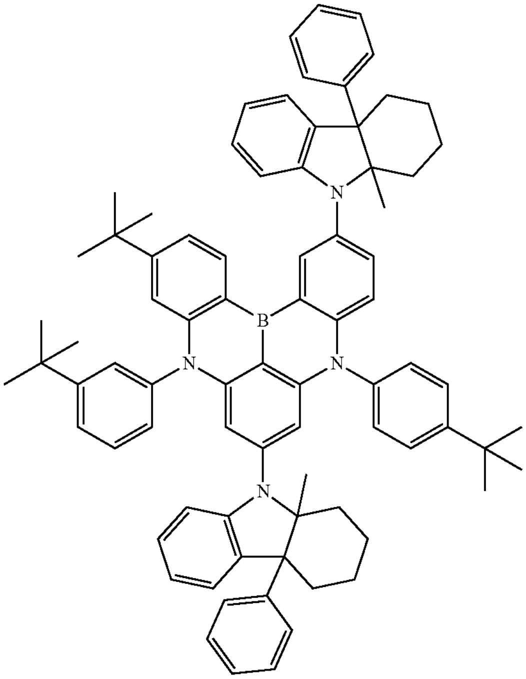

-continued
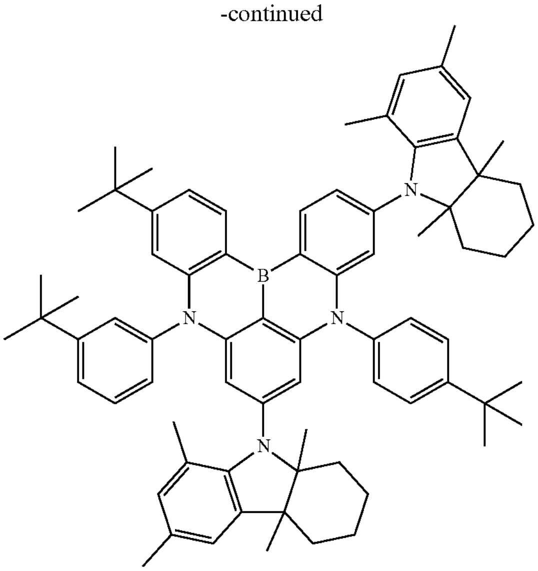
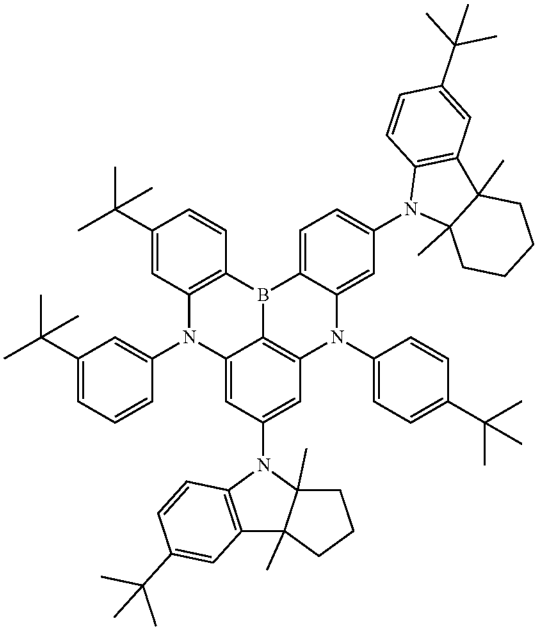
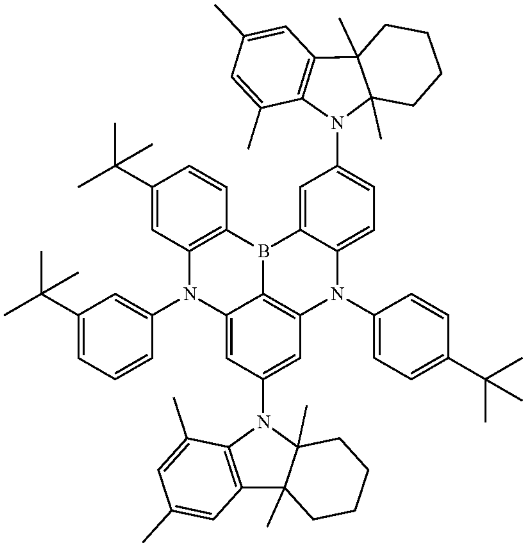
-continued
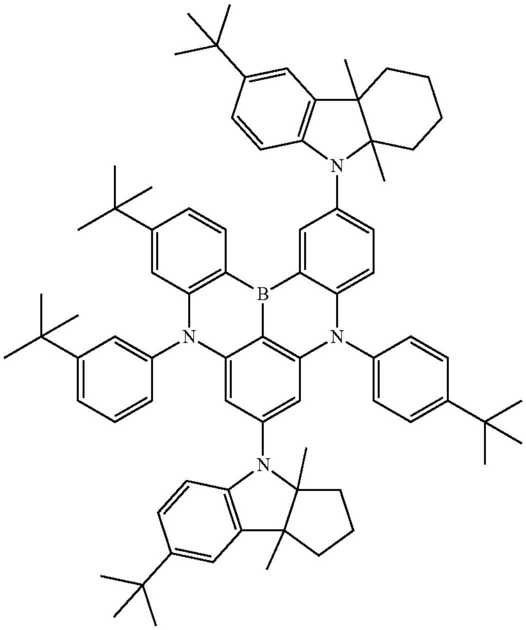
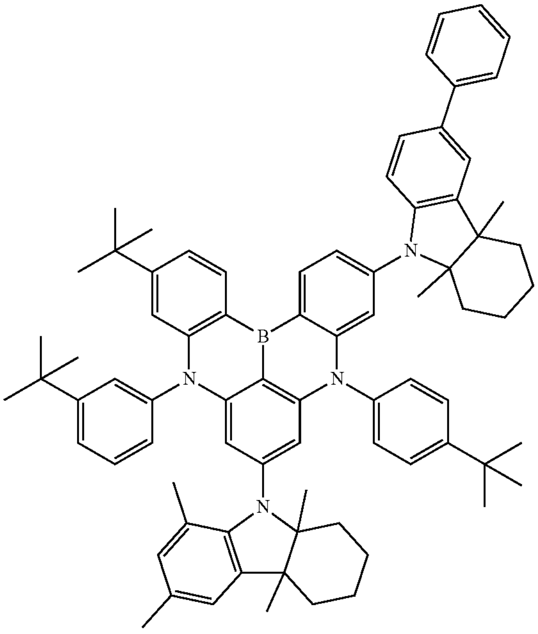

-continued
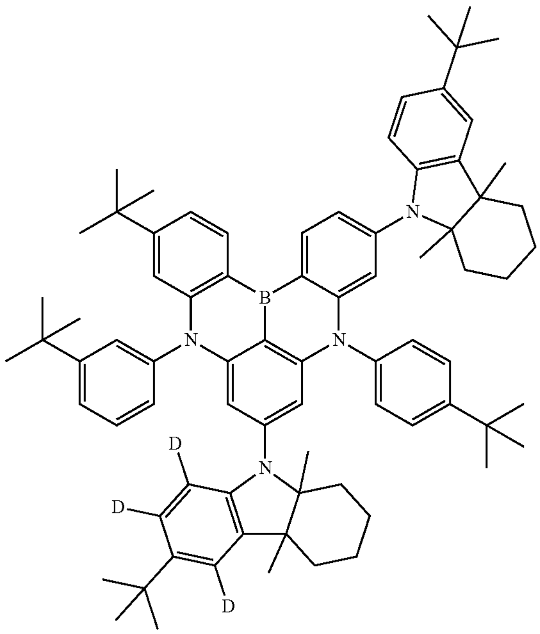
-continued
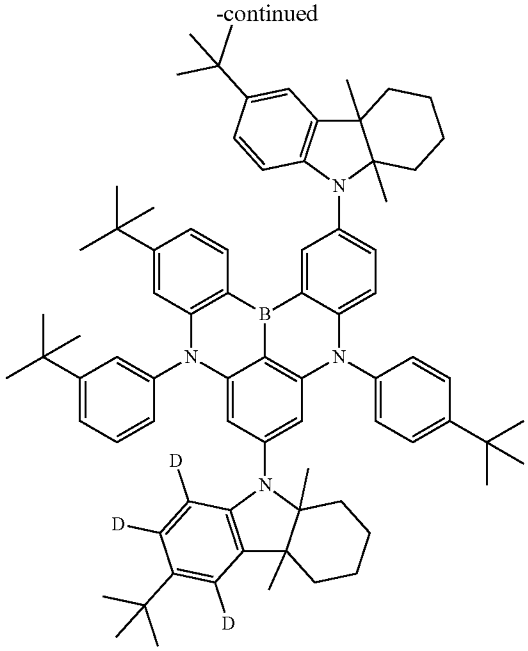
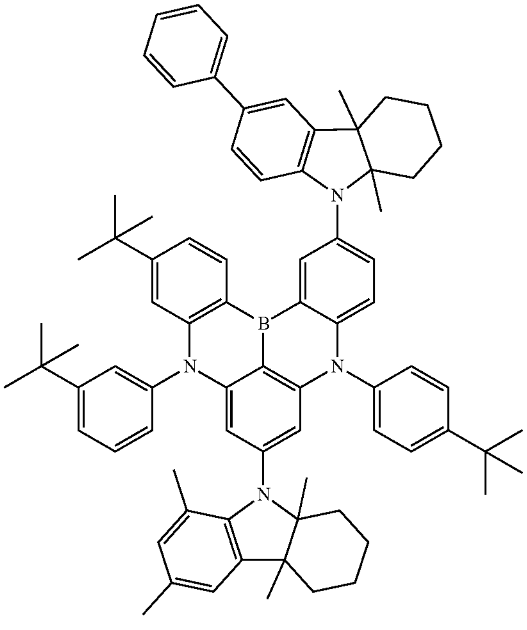
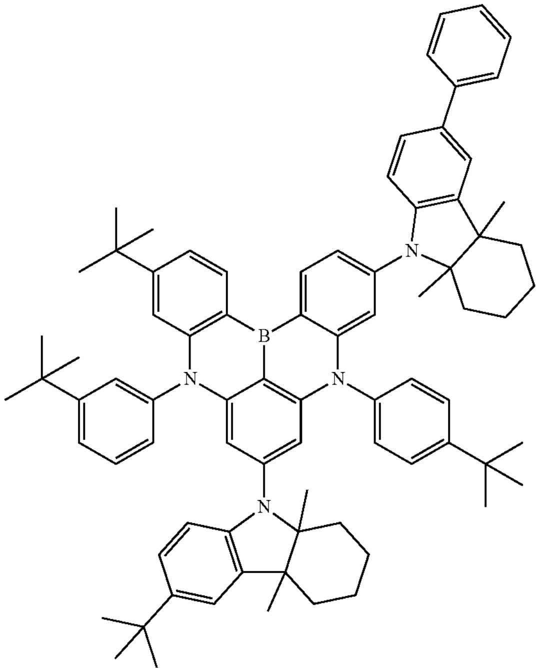

-continued
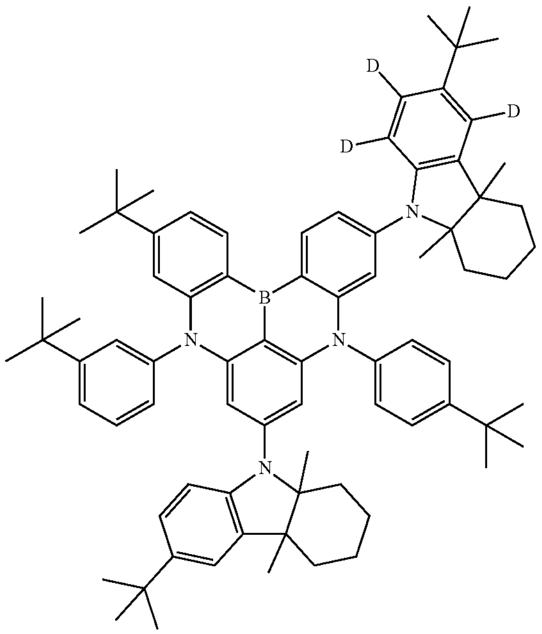
-continued
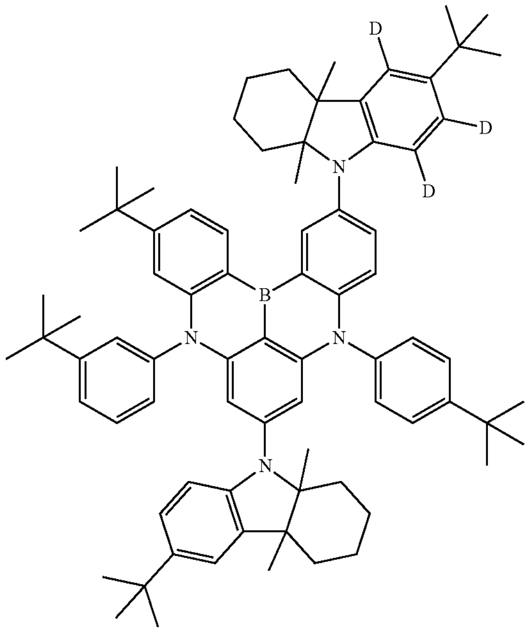
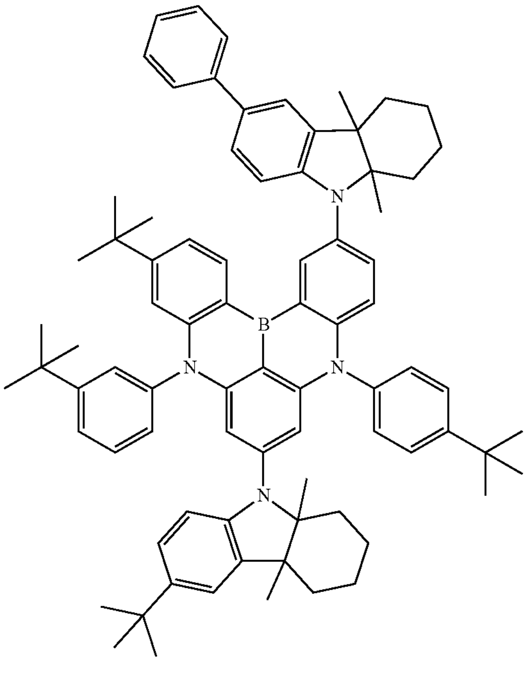
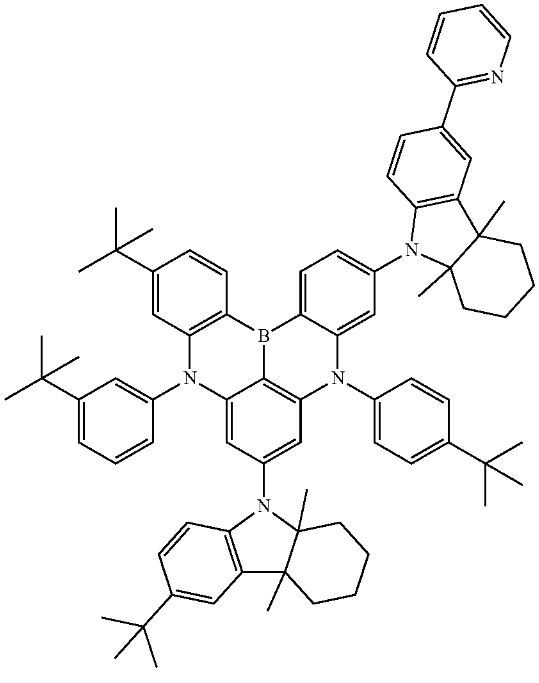

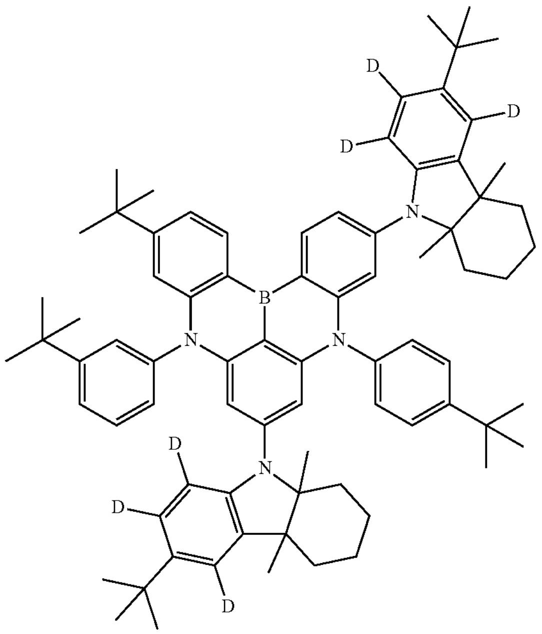
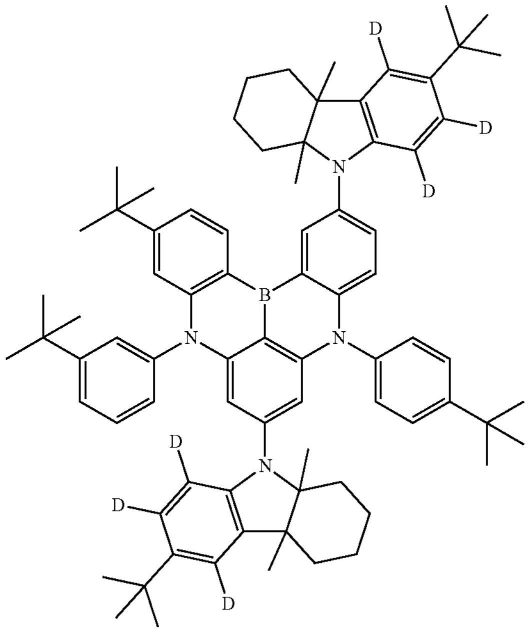
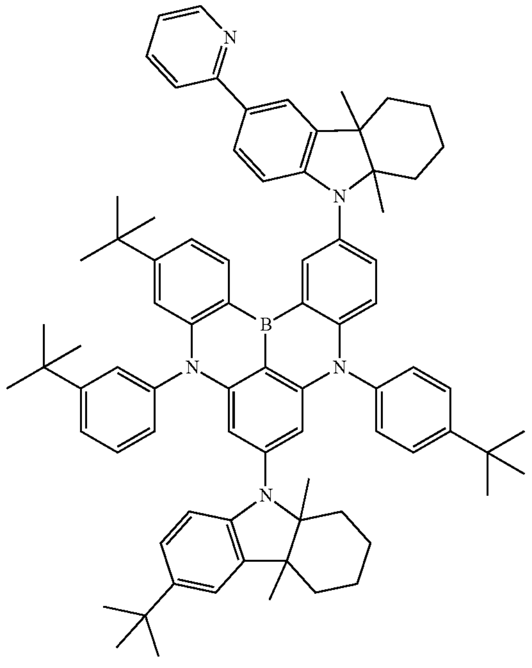
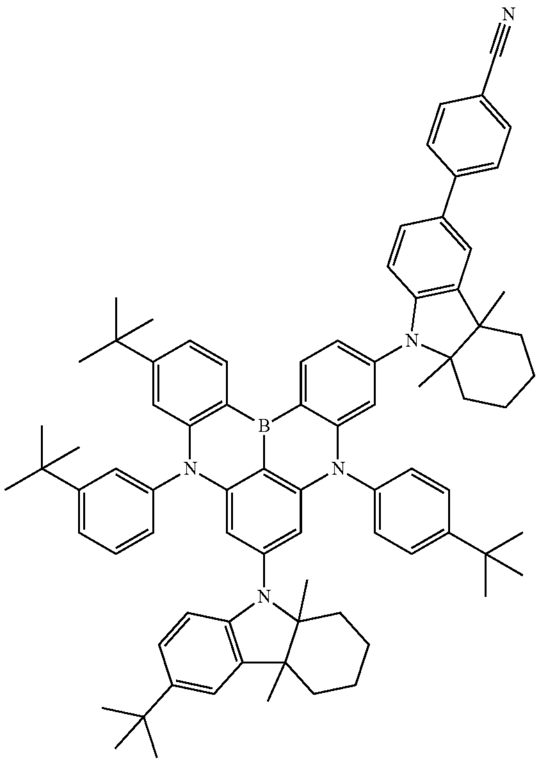

-continued
-continued
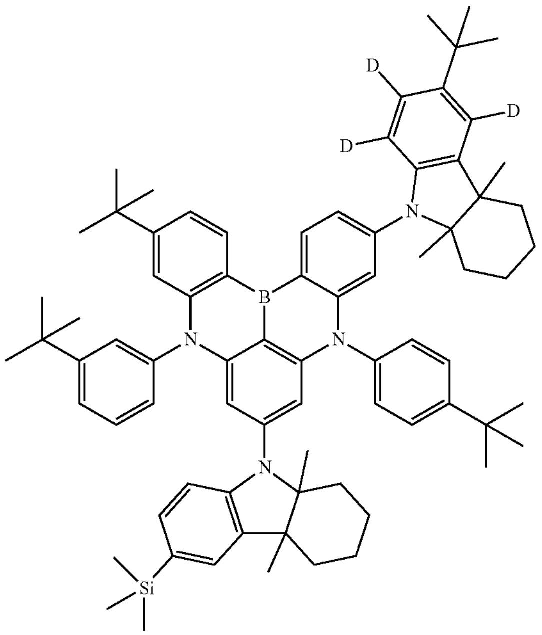
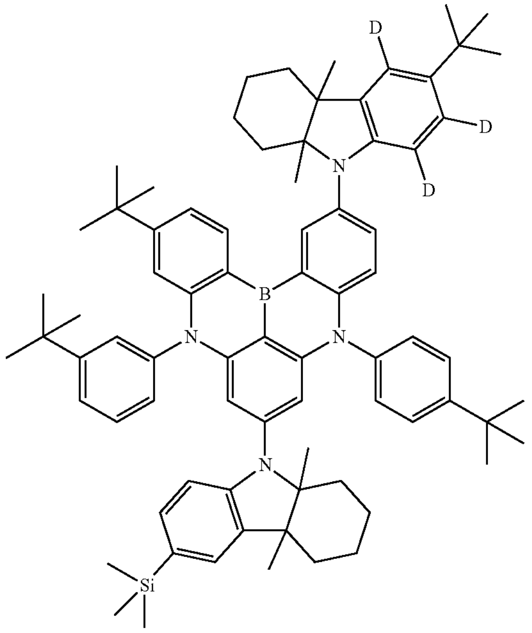
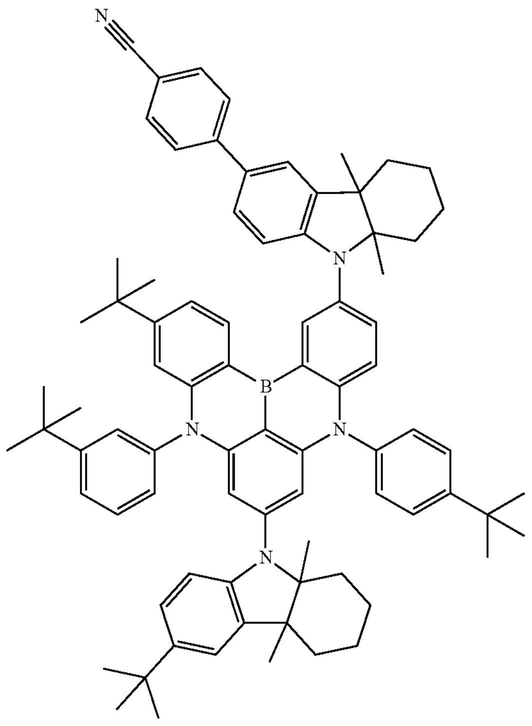
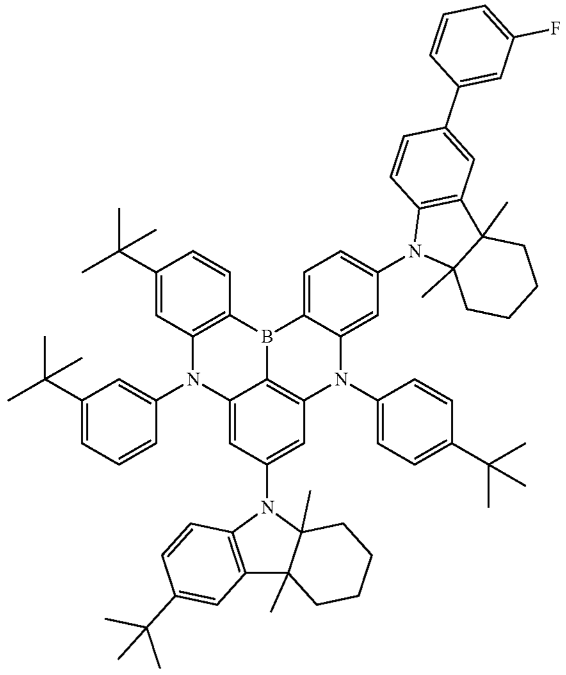

-continued
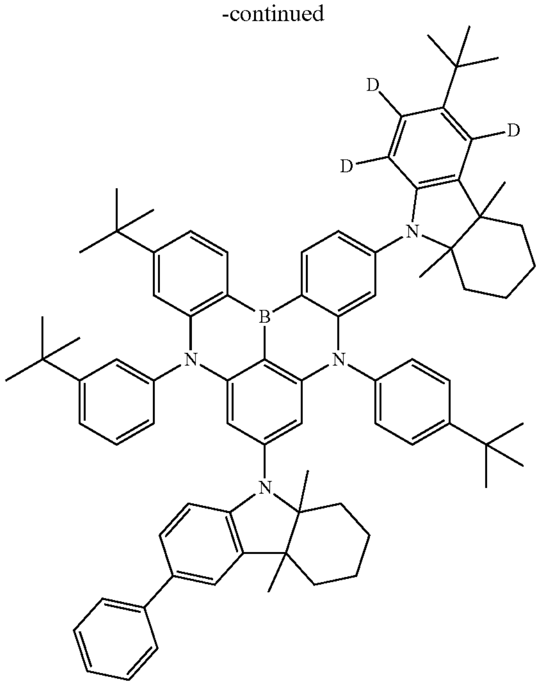
-continued
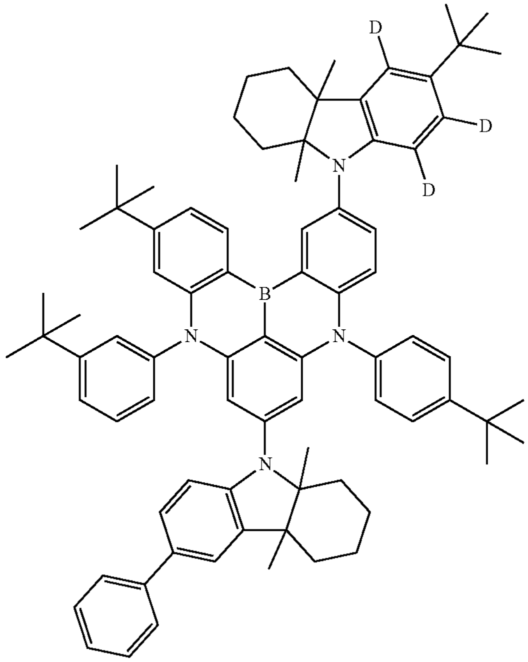
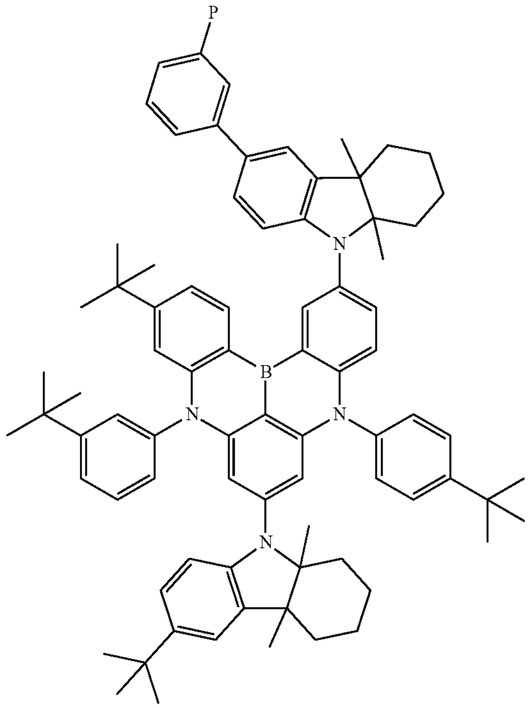
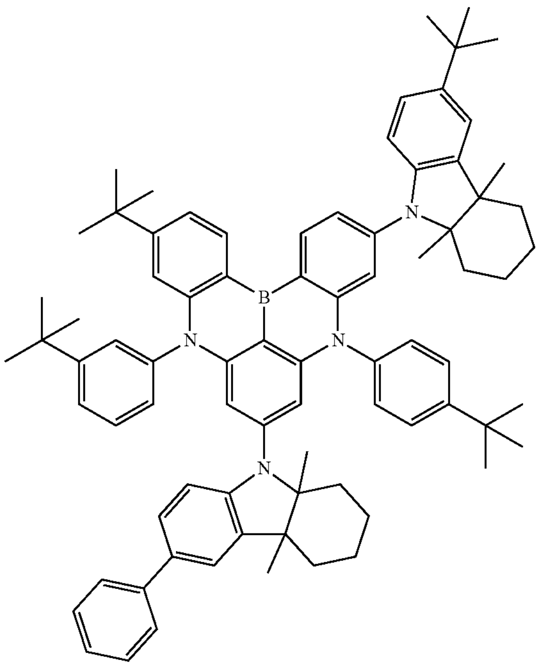

-continued
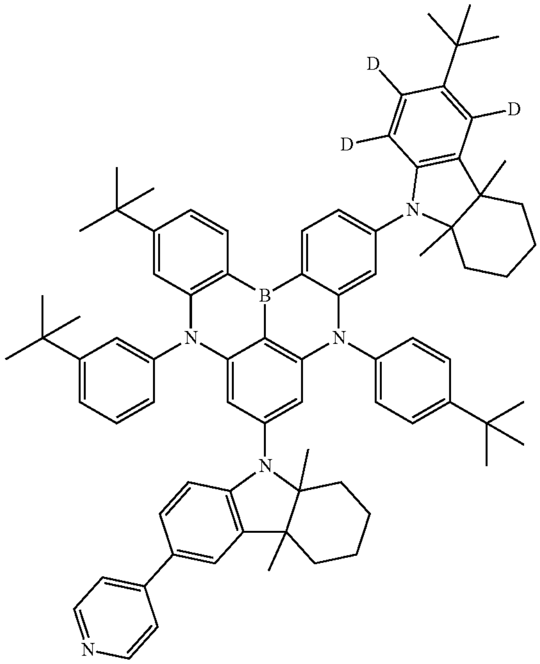
-continued
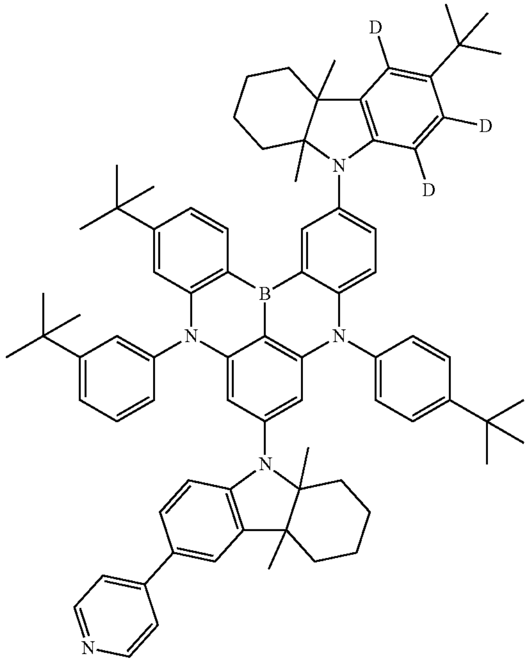
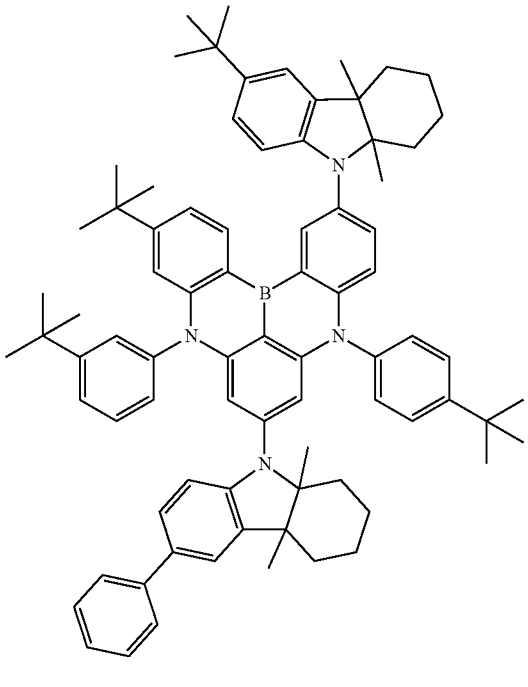
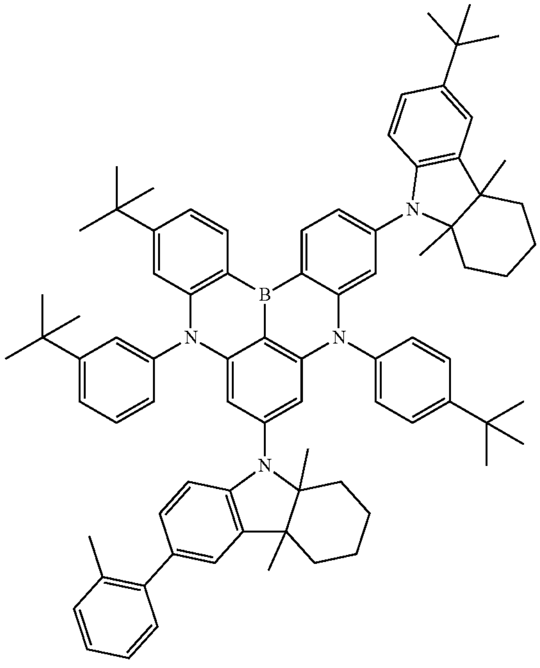

-continued
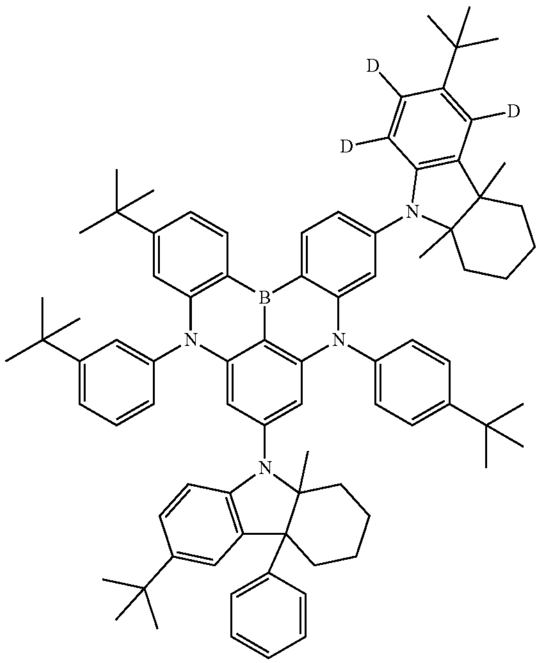
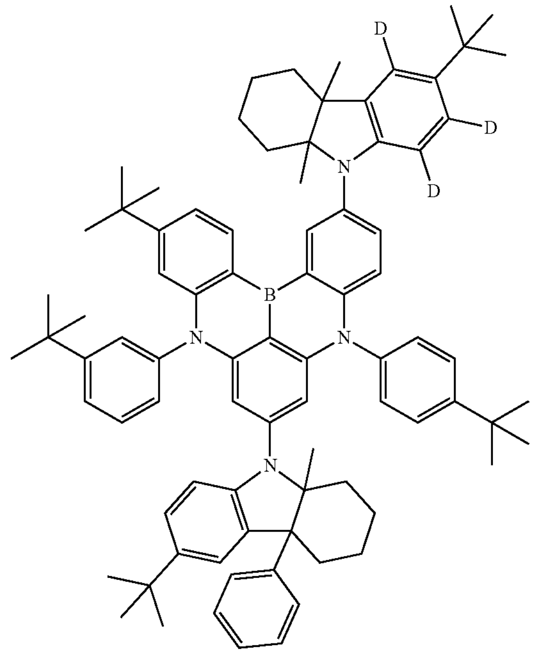
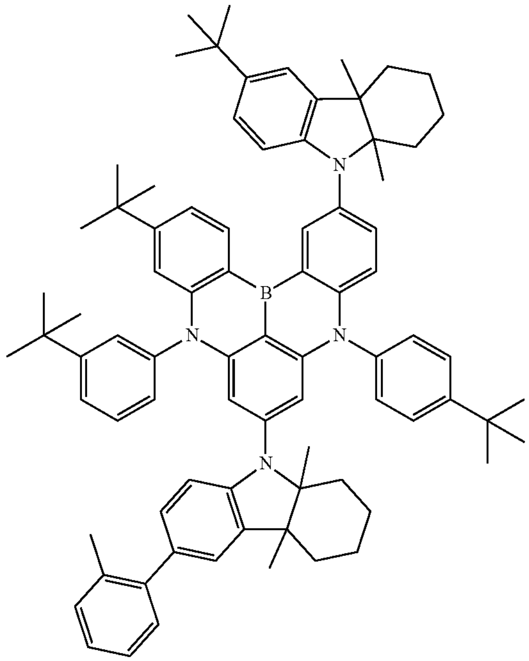
-continued
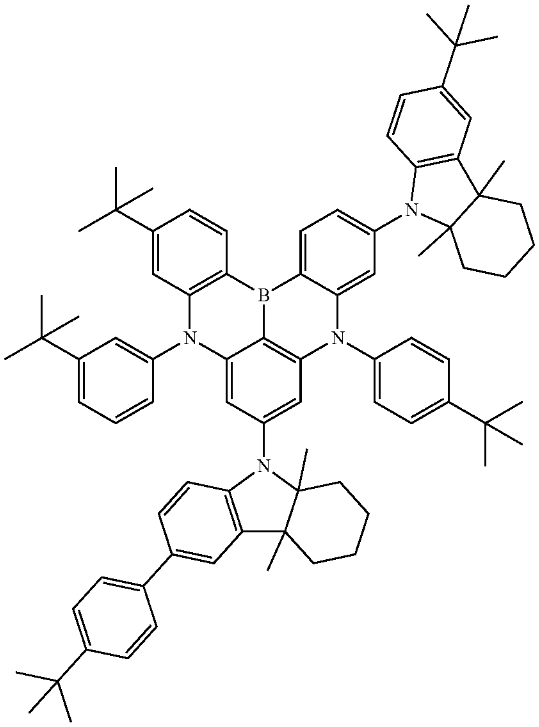

-continued
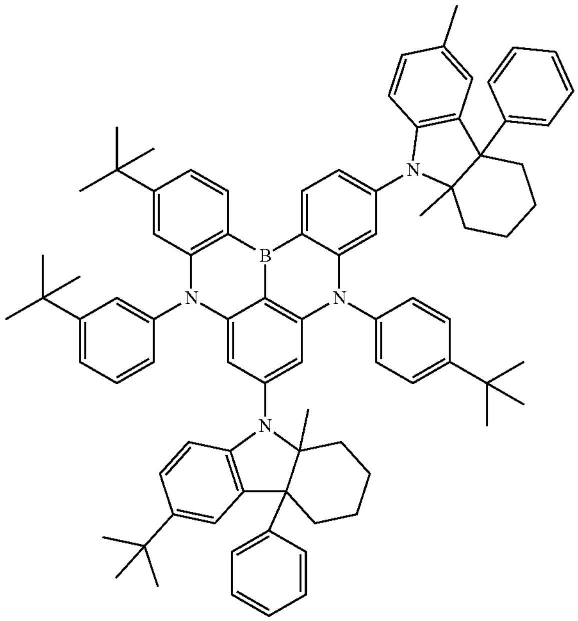
-continued
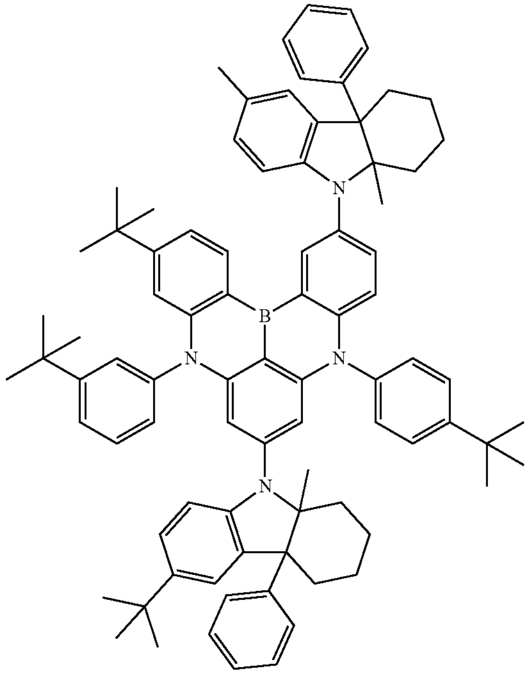
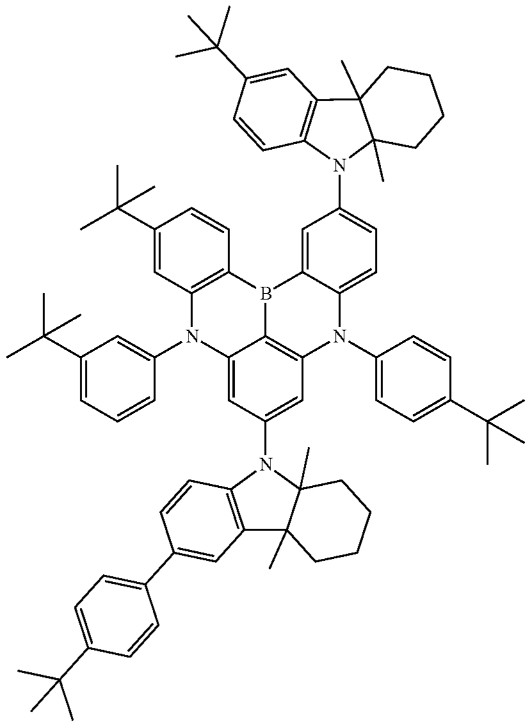
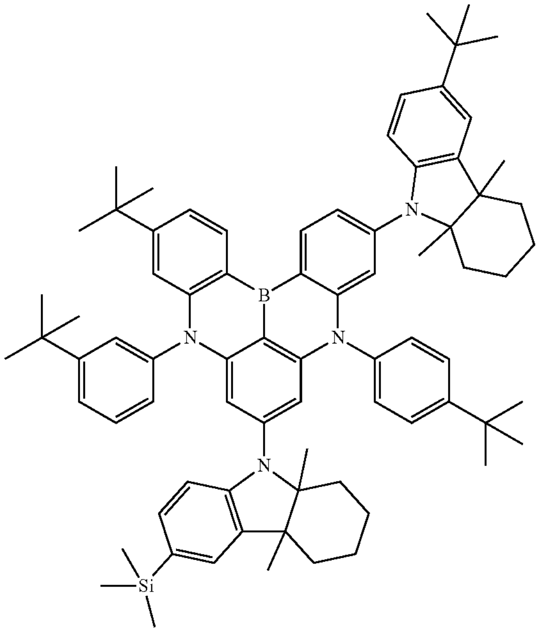

-continued
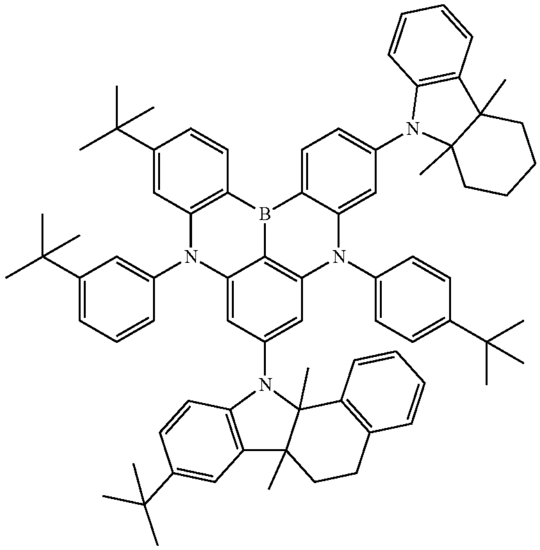
-continued
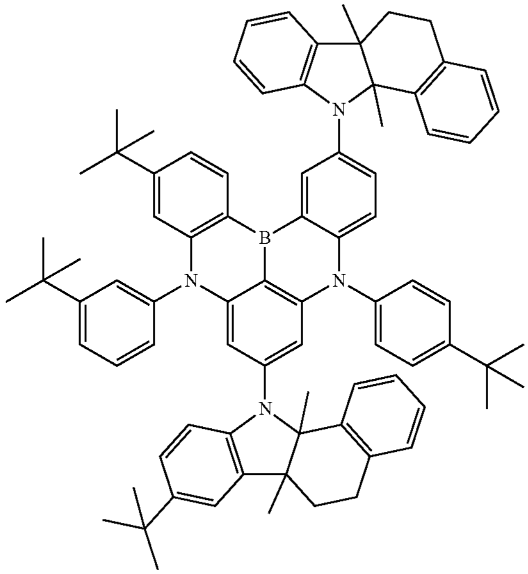
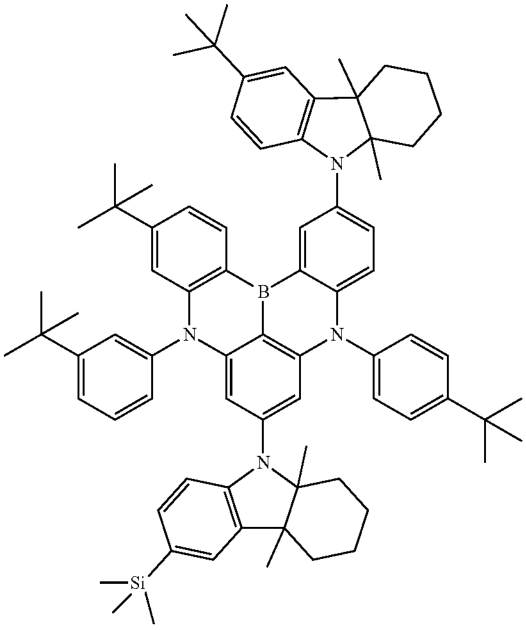
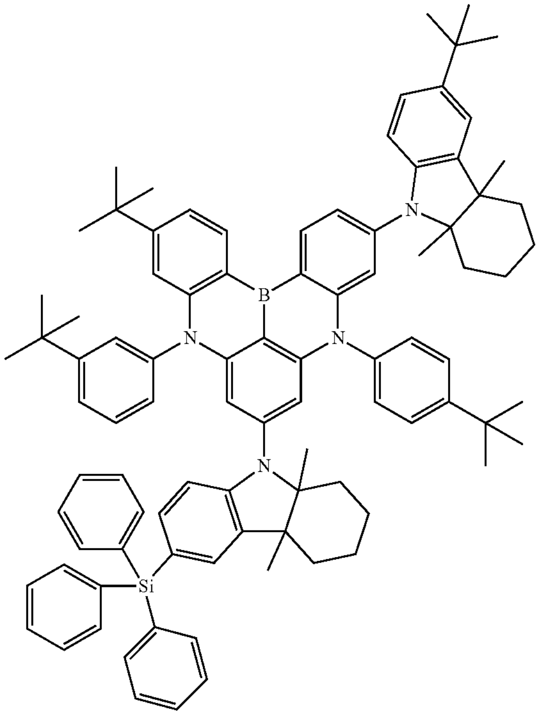

-continued
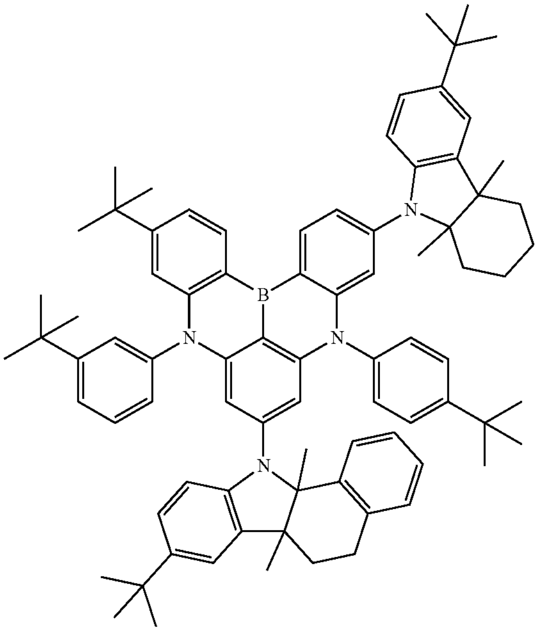
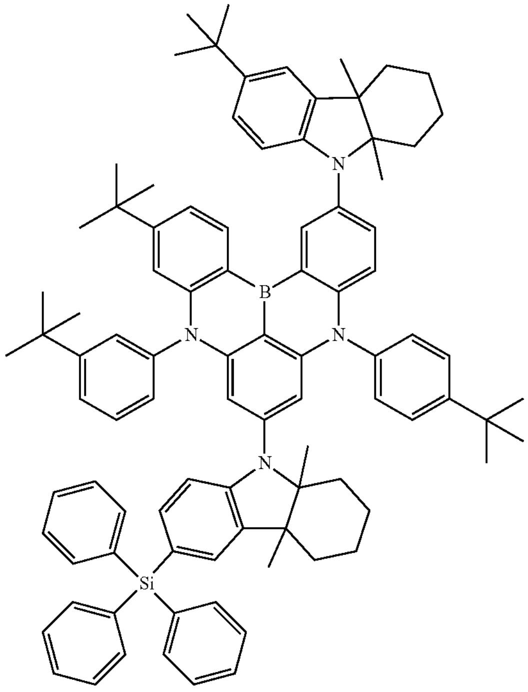
-continued
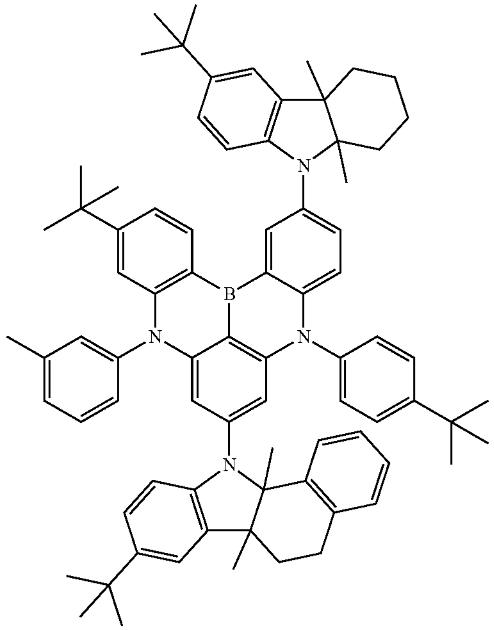
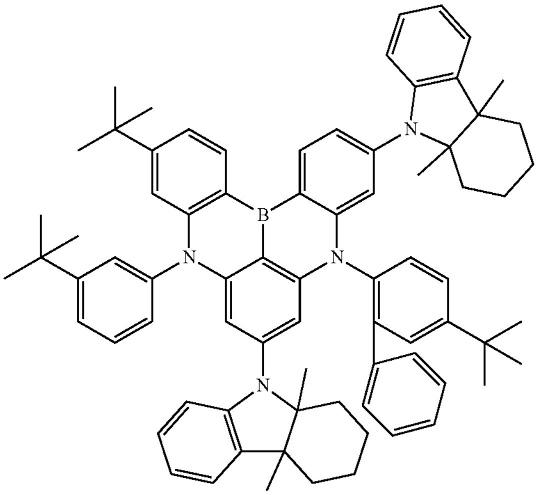
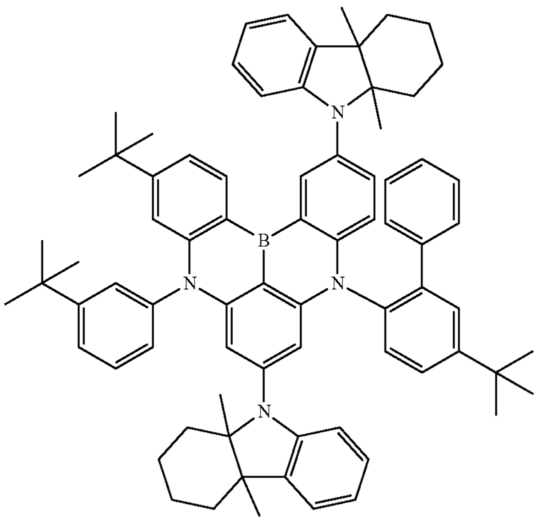

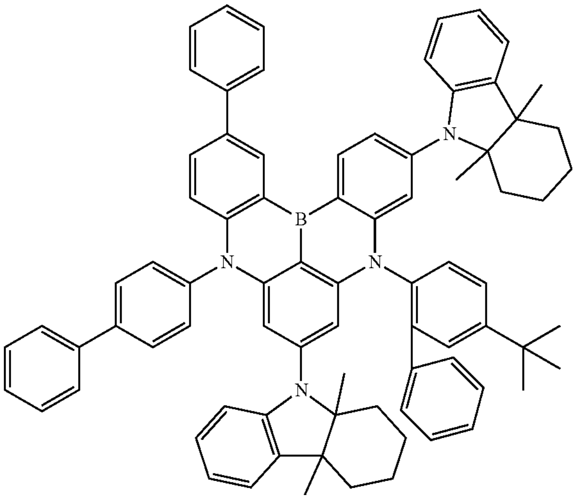
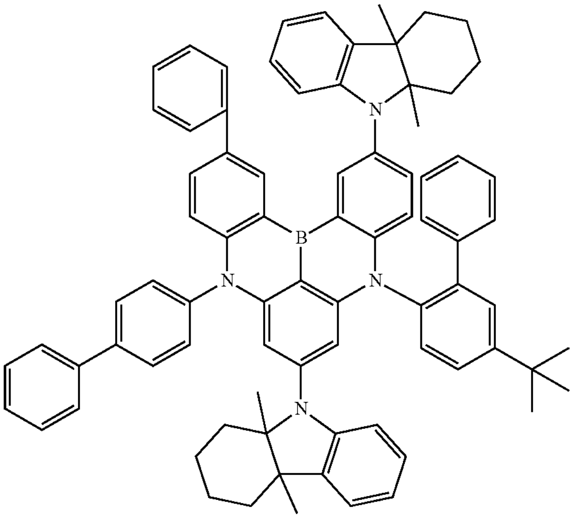
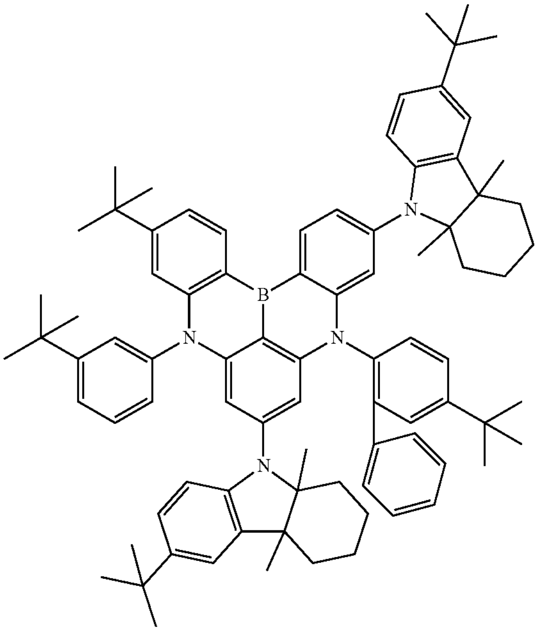
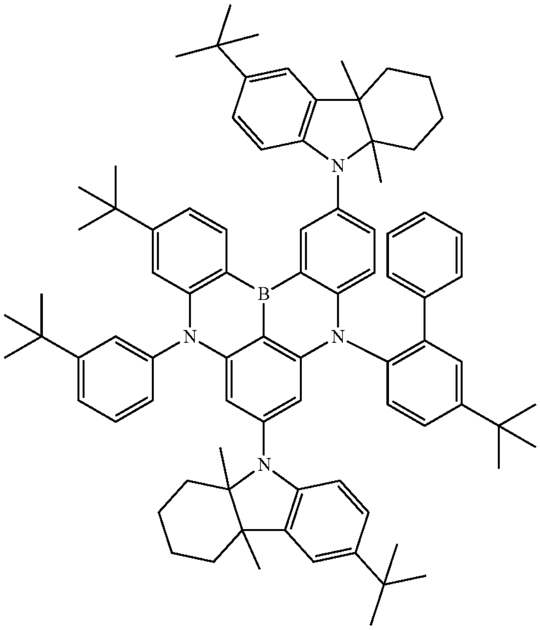
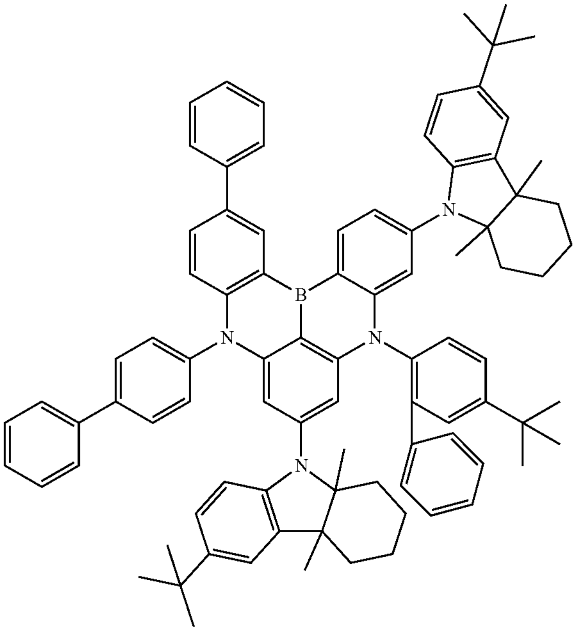

-continued
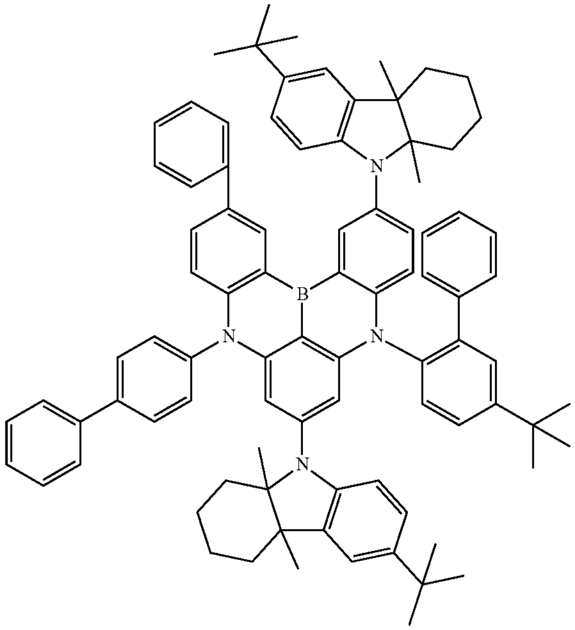
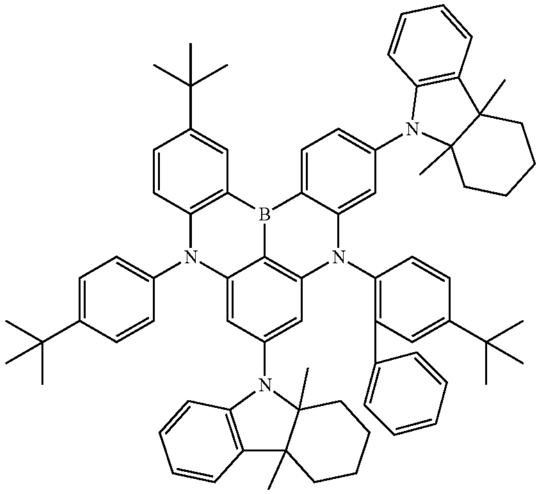
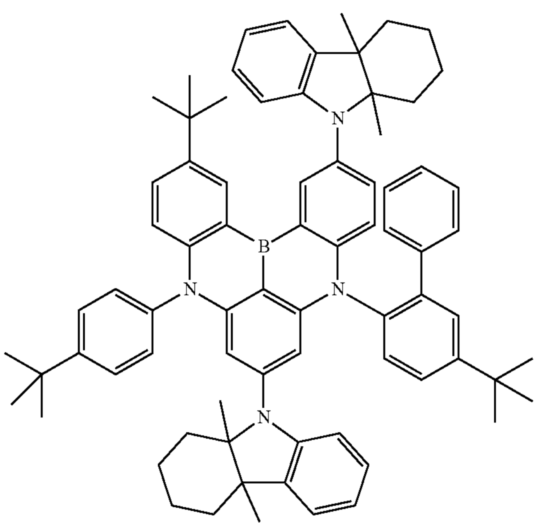
-continued
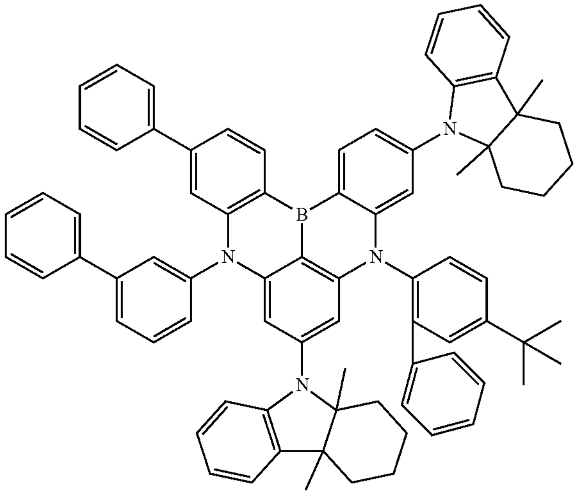
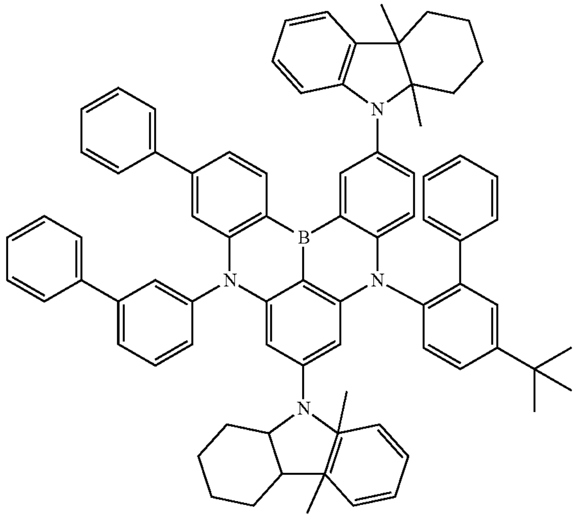
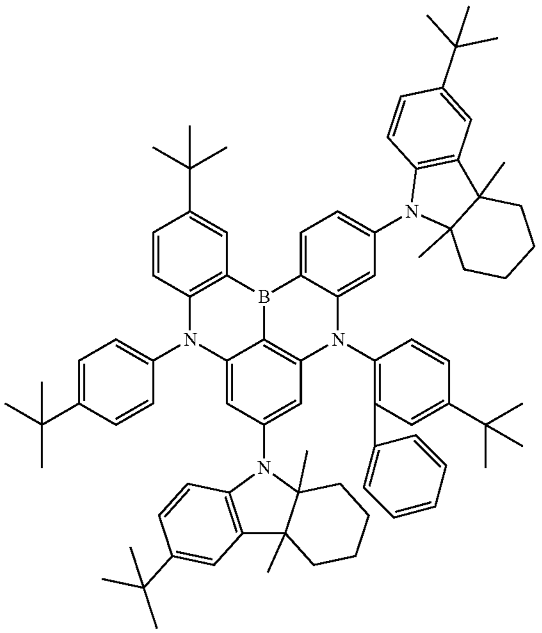

-continued
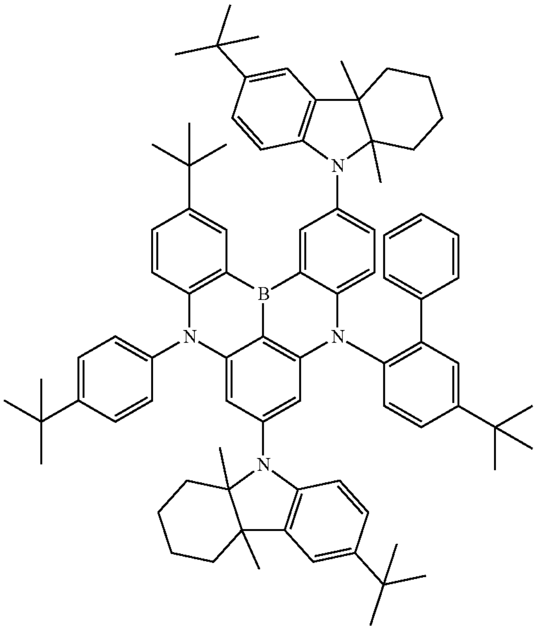
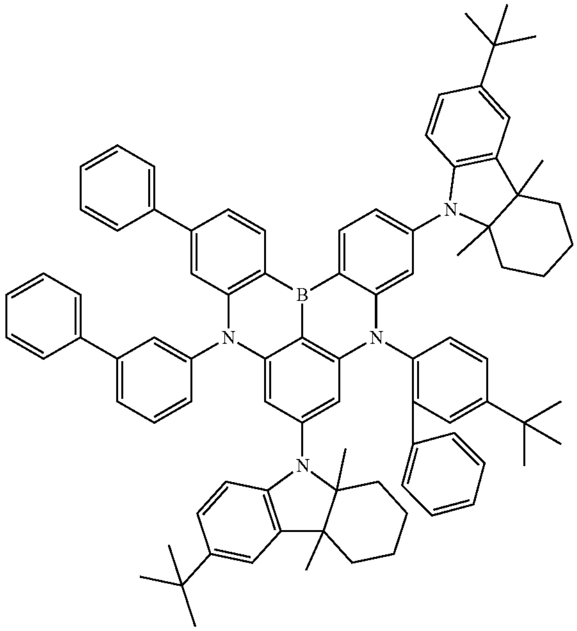
-continued
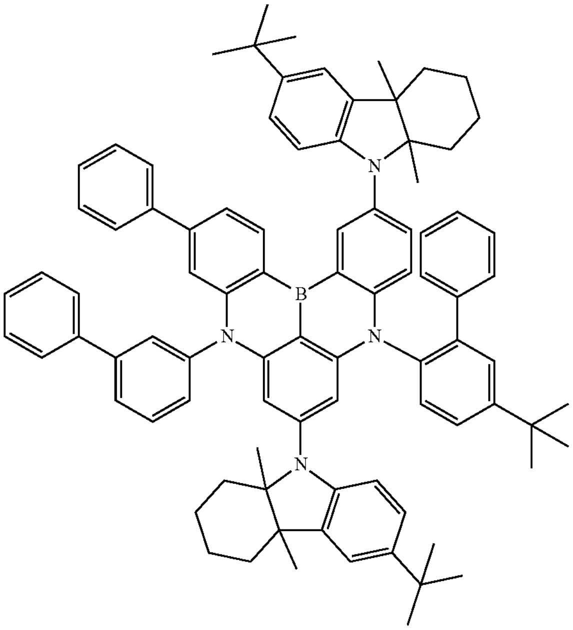
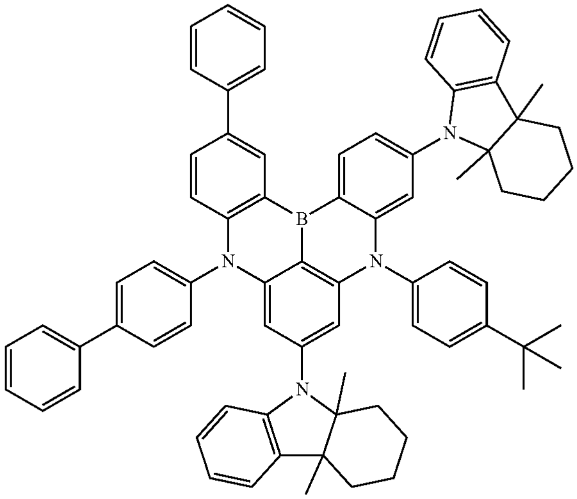
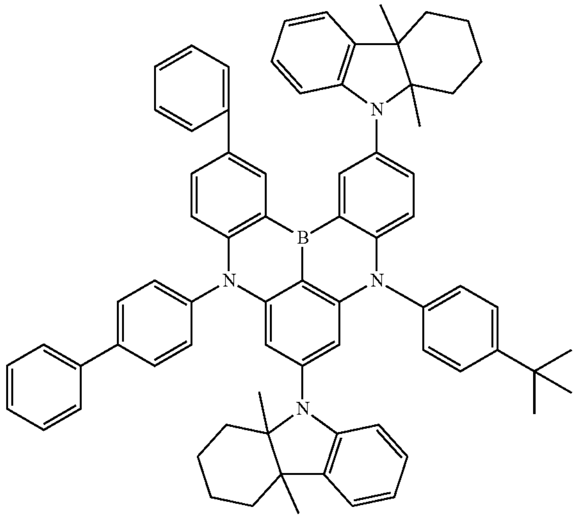

-continued
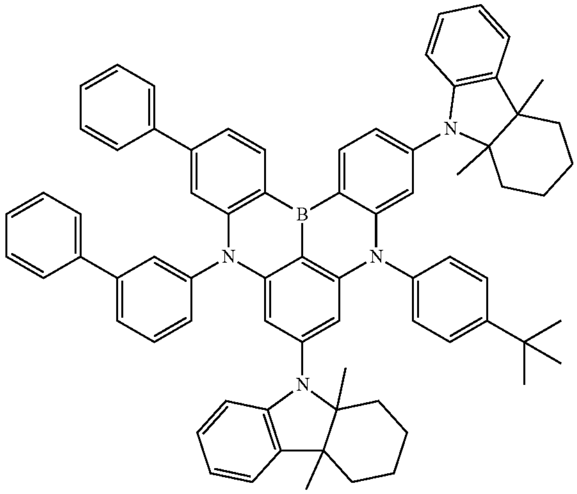
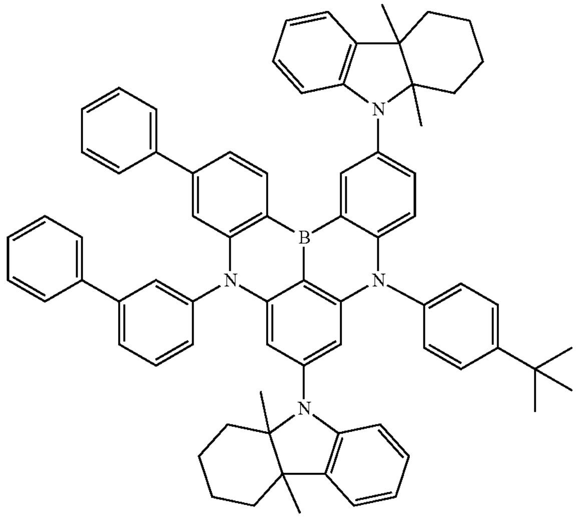
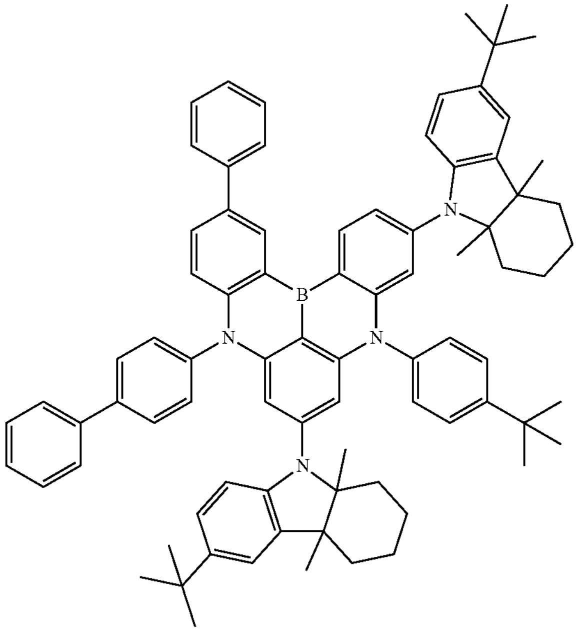
-continued
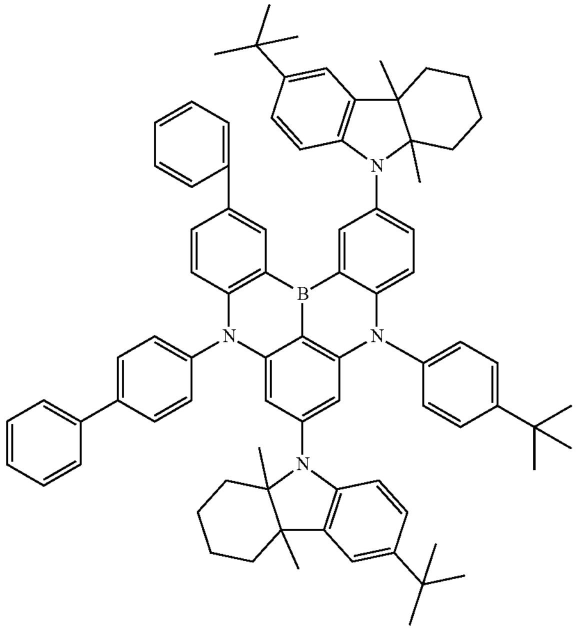
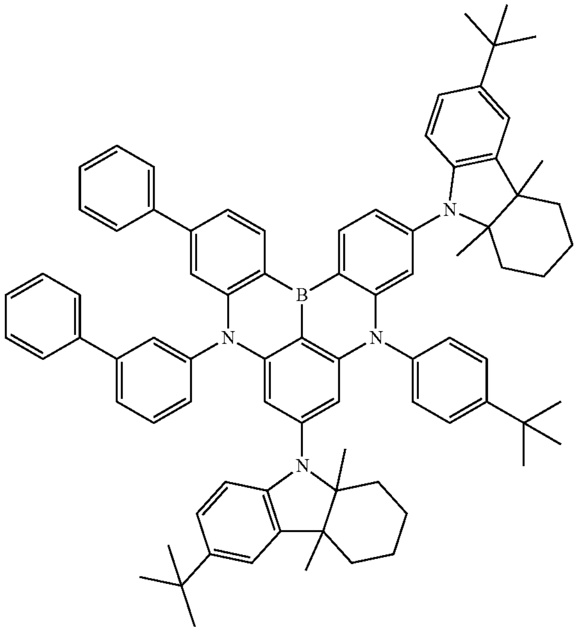

-continued
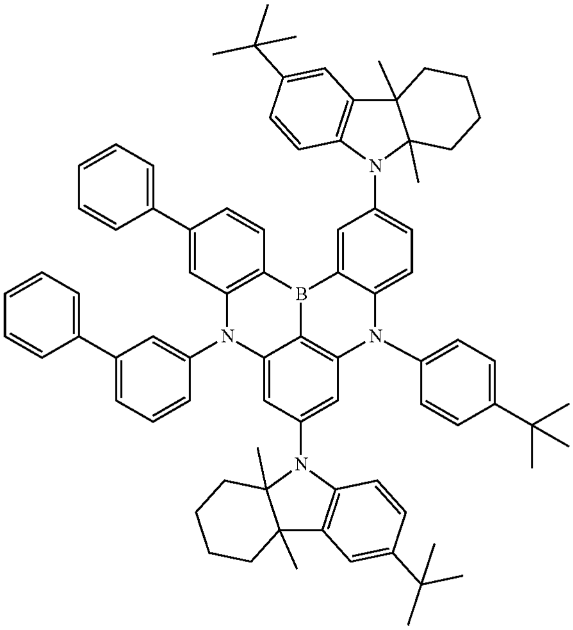 [SMILES: CC(C)(C)c1ccc(N2c3ccc(N4c5ccc(C(C)(C)C)cc5C5(C)CCCCC45C)cc3B3c4ccc(-c5ccccc5)cc4N(c4cccc(-c5ccccc5)c4)c4cc(N5c6ccc(C(C)(C)C)cc6C6(C)CCCCC56C)cc2c43)cc1]
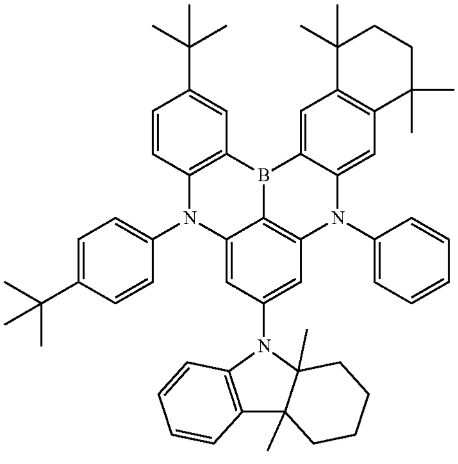
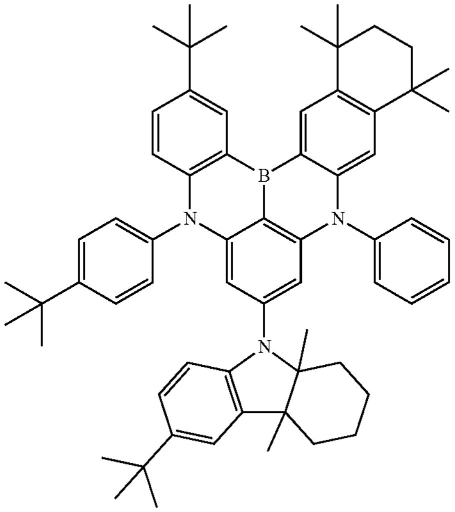
-continued
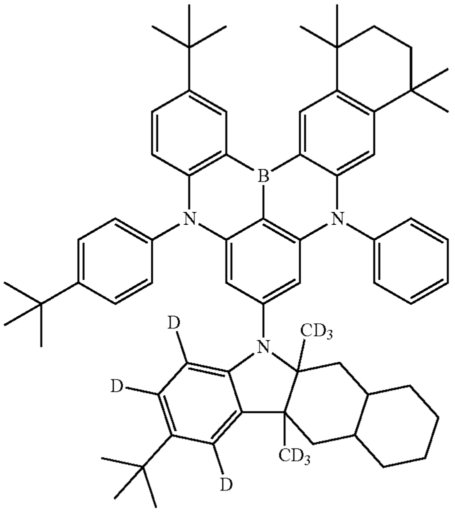
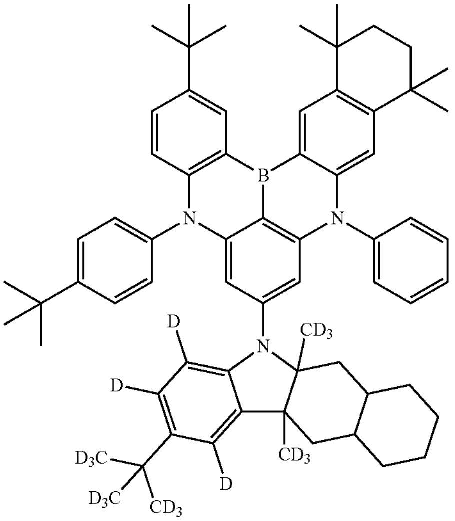
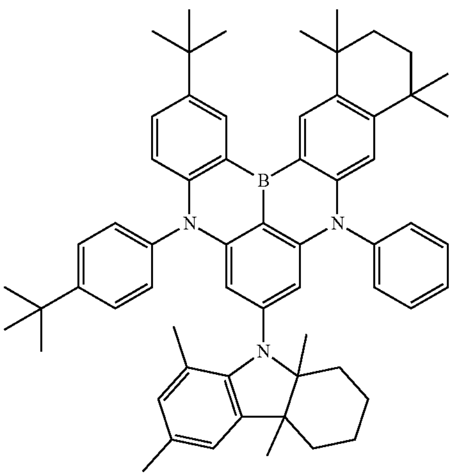

-continued
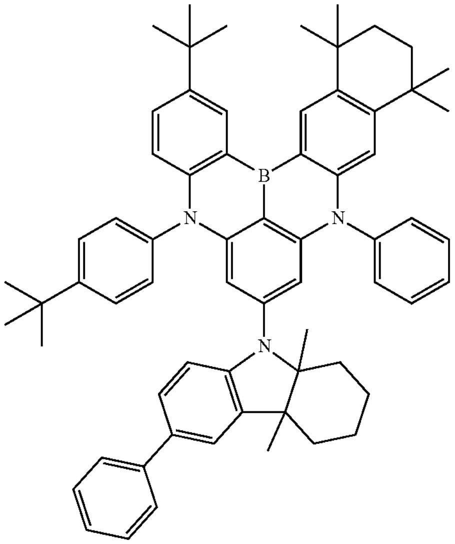
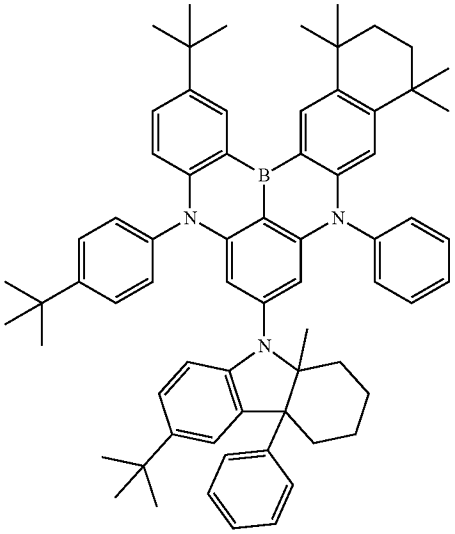
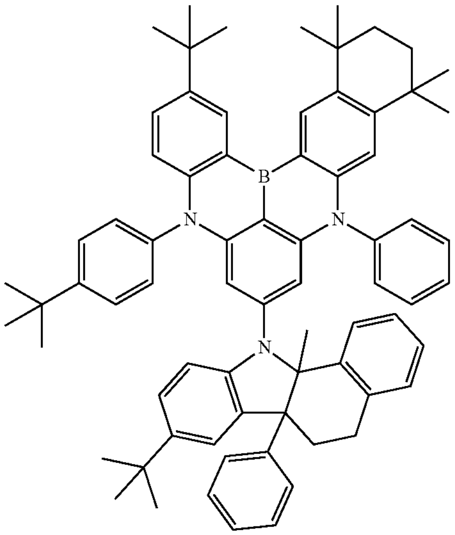
-continued
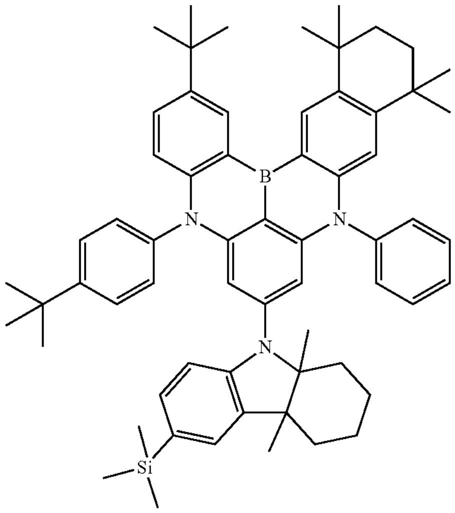
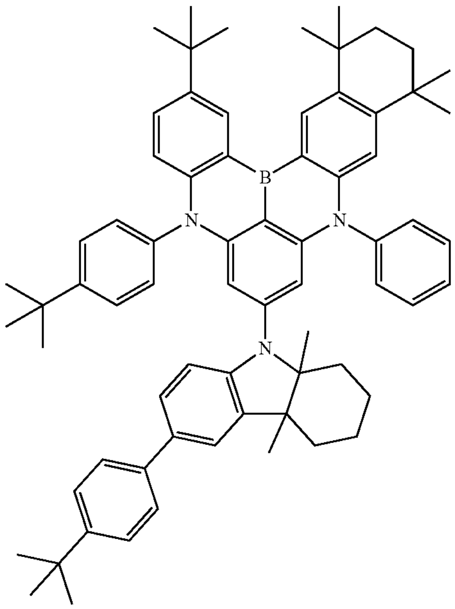
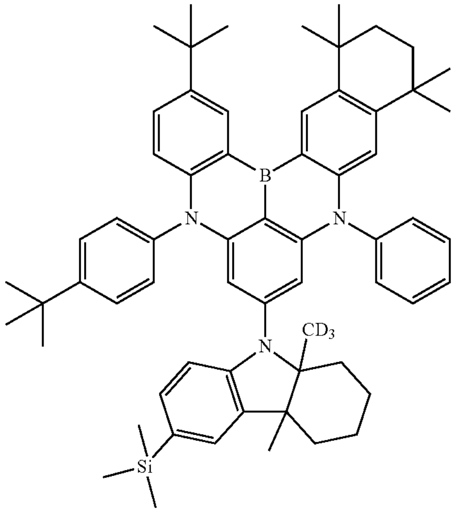

-continued
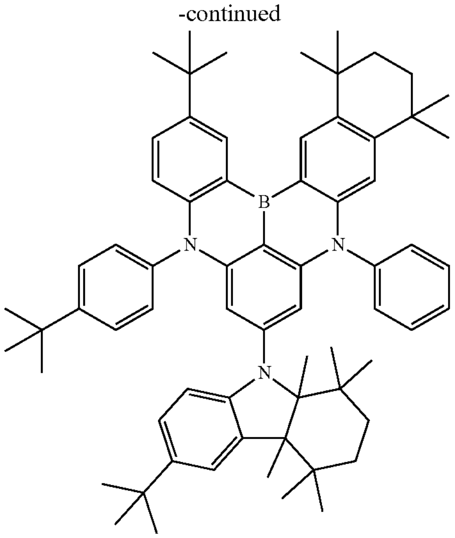
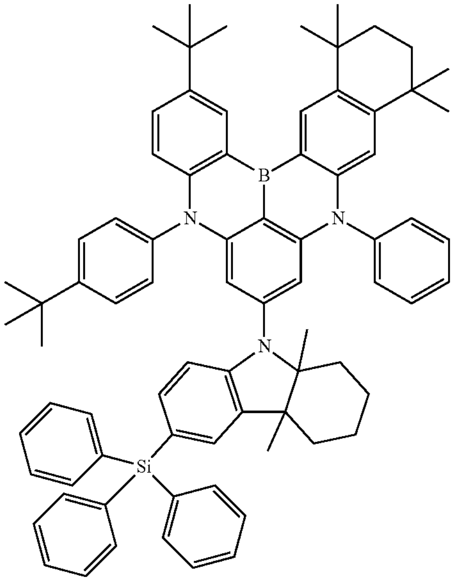
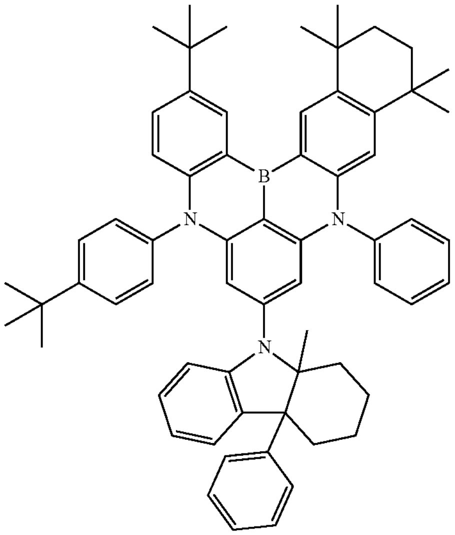
-continued
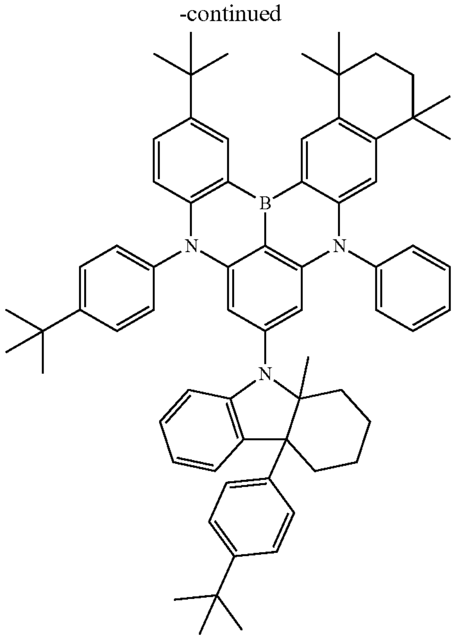
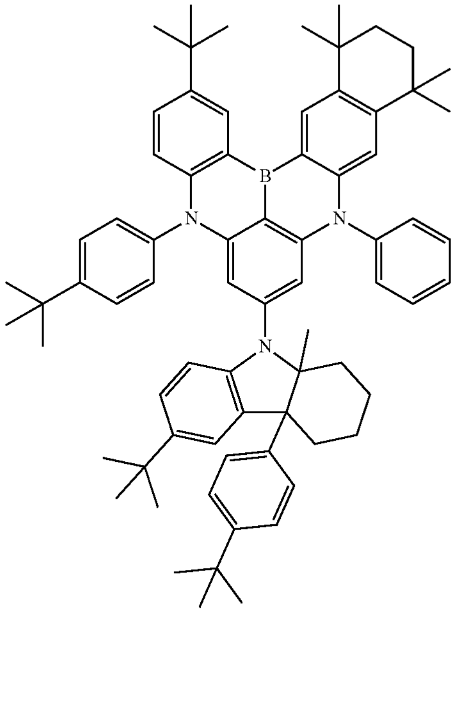

-continued
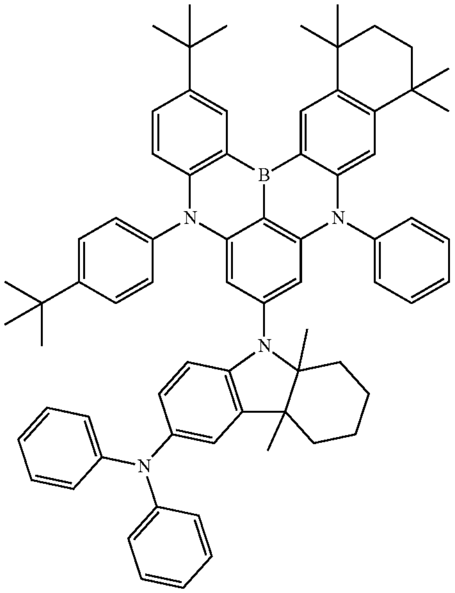
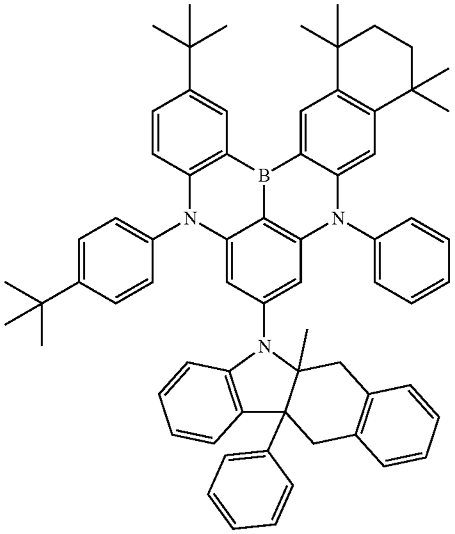
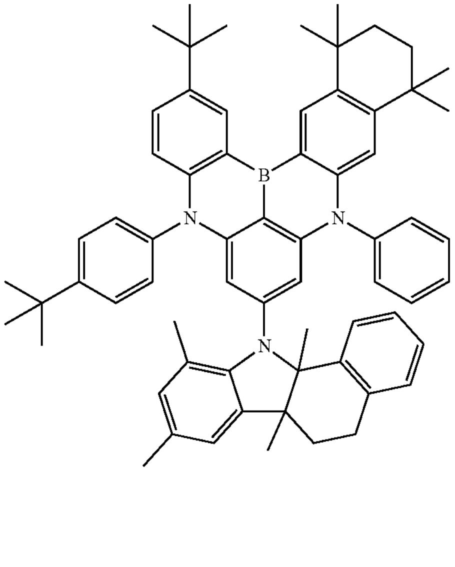
-continued
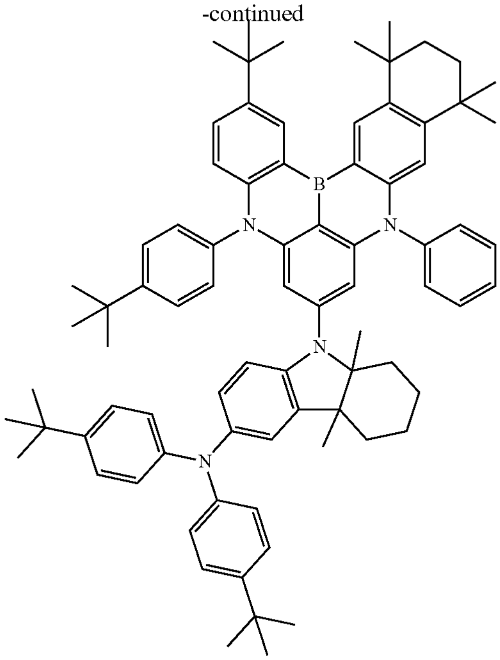
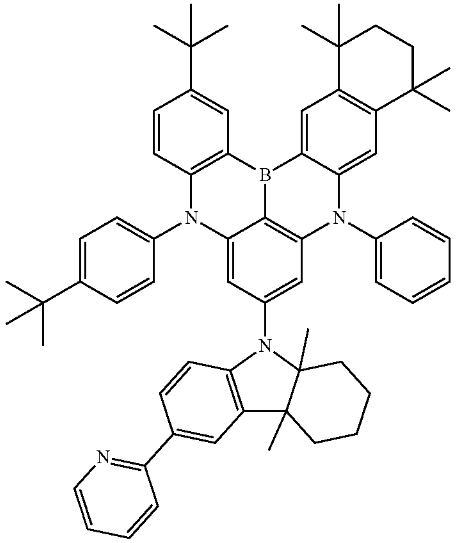
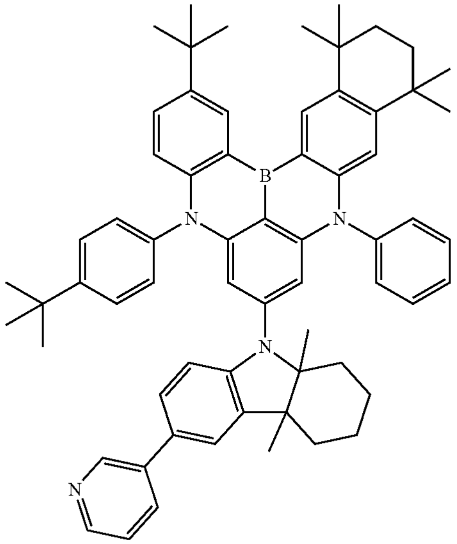

-continued
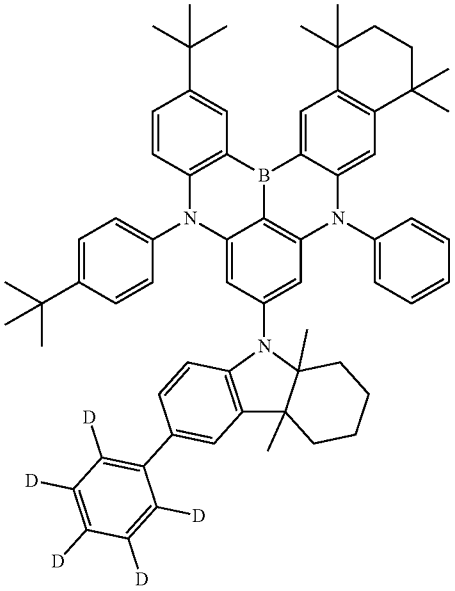
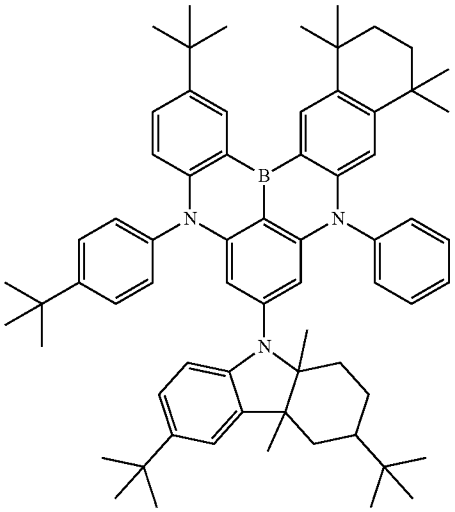
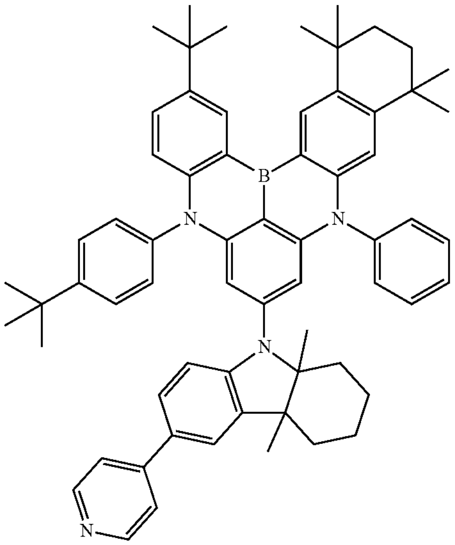
-continued
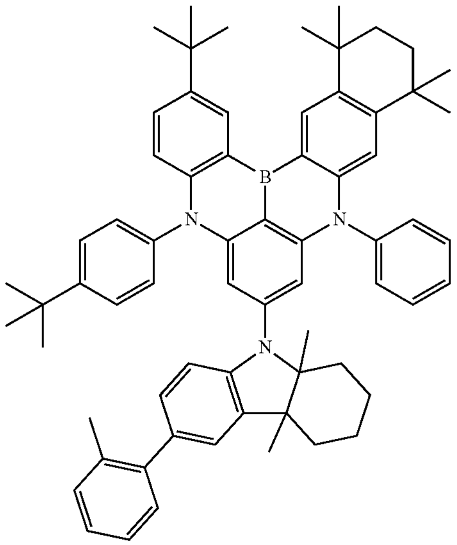
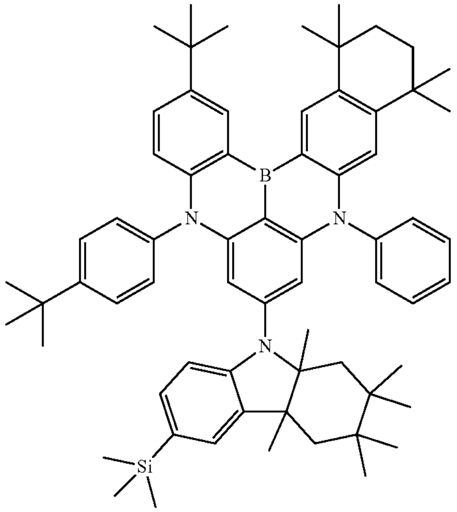
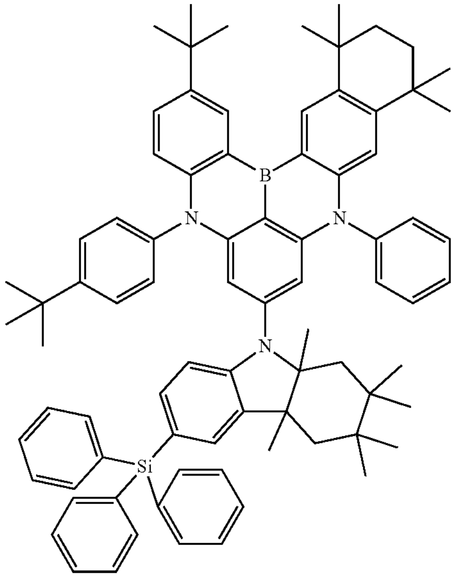

-continued
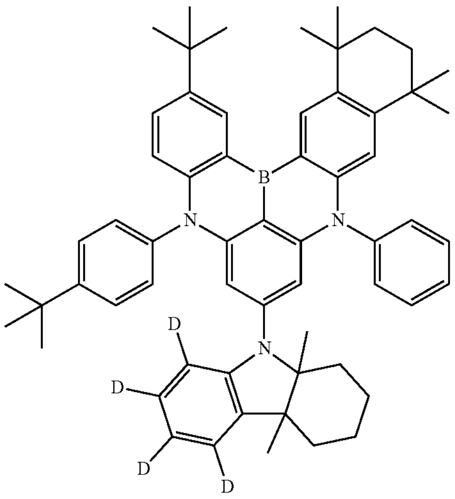
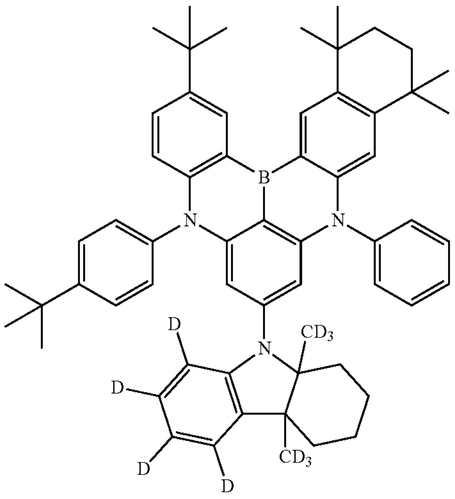
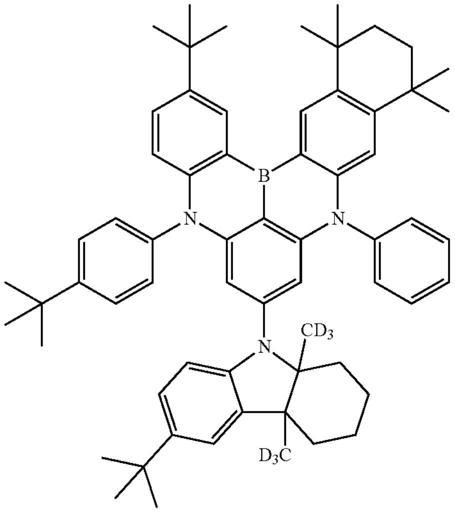
-continued
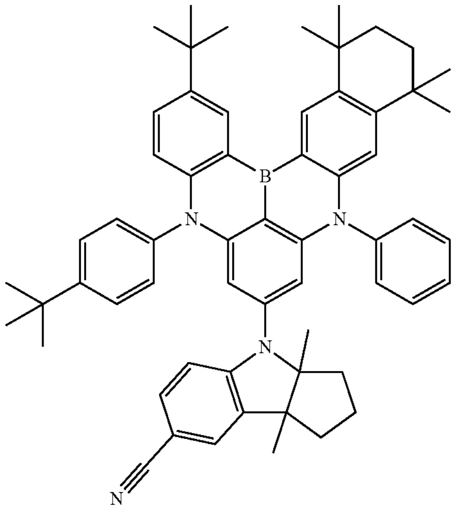
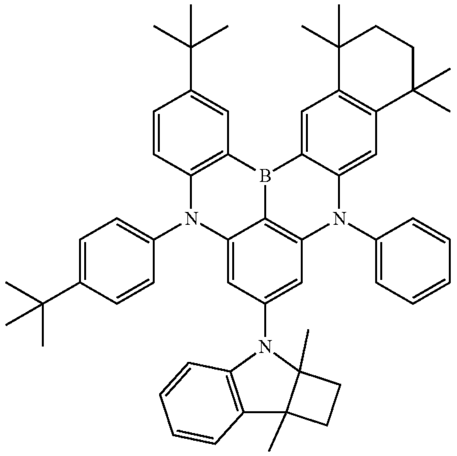
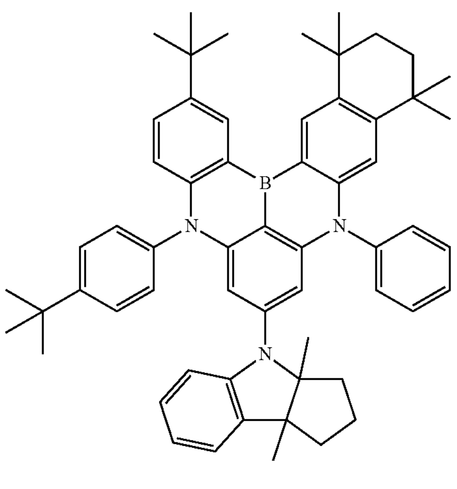

-continued
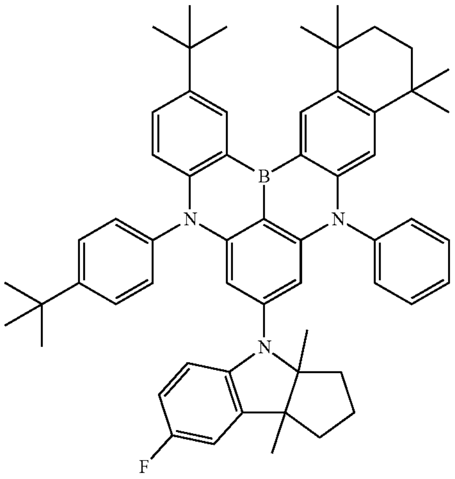
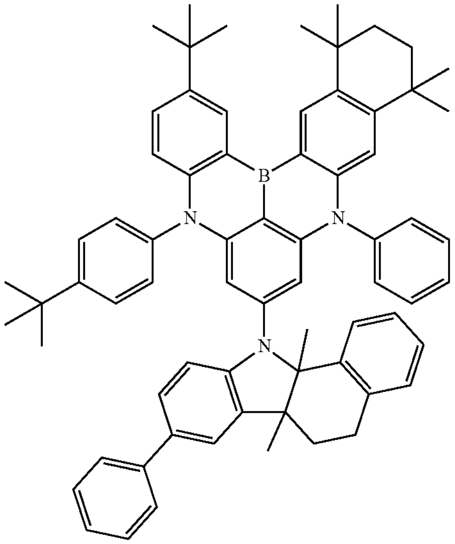
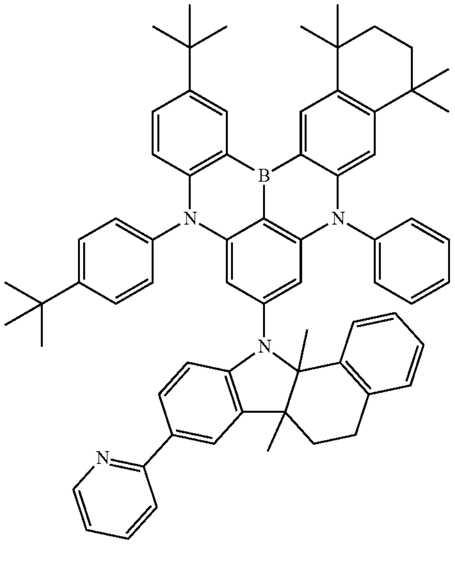
-continued
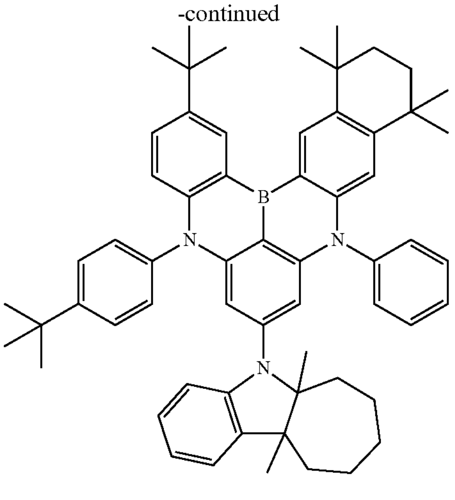
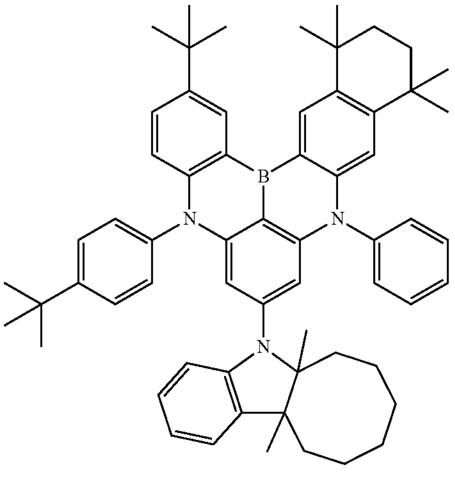
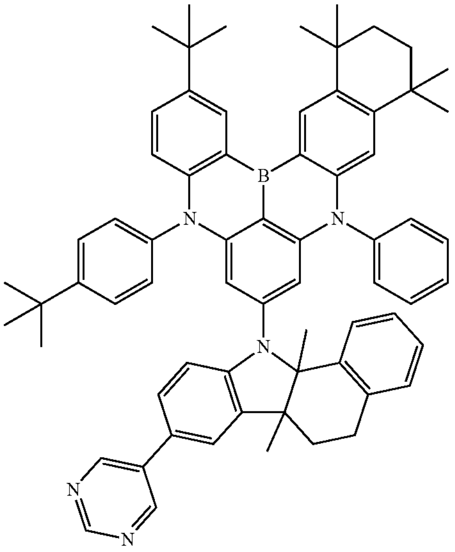

-continued
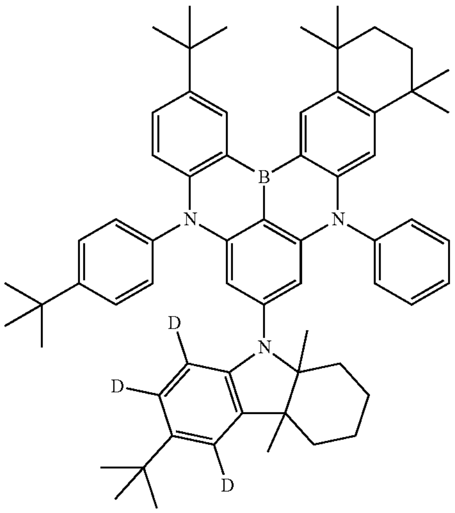
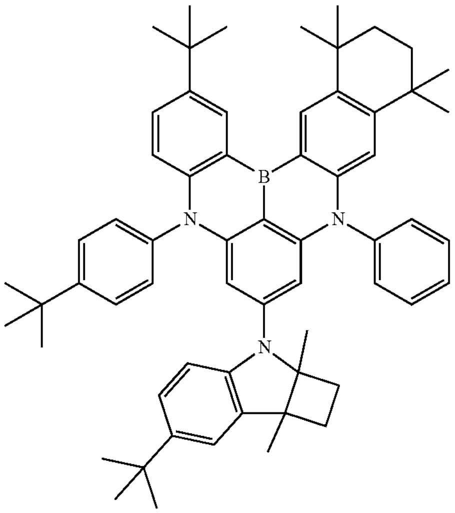
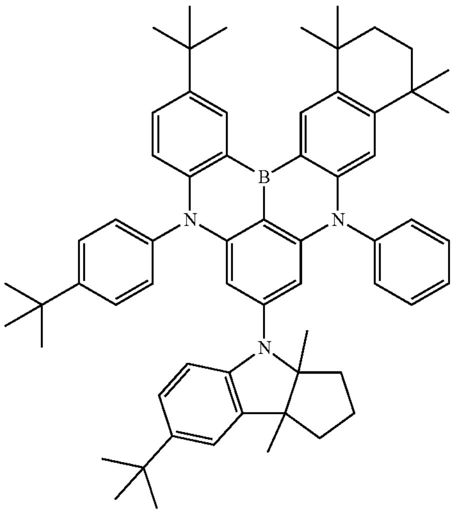
-continued
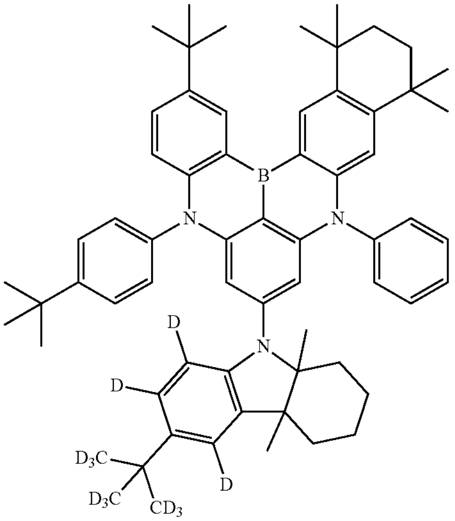
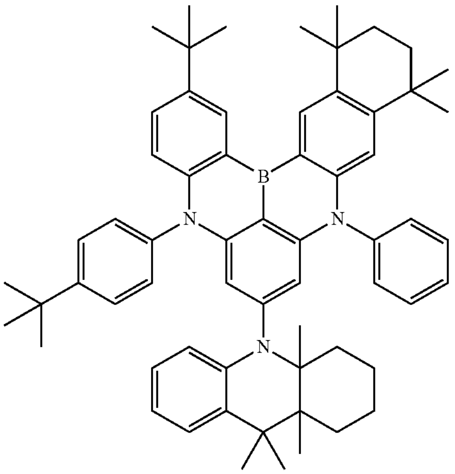
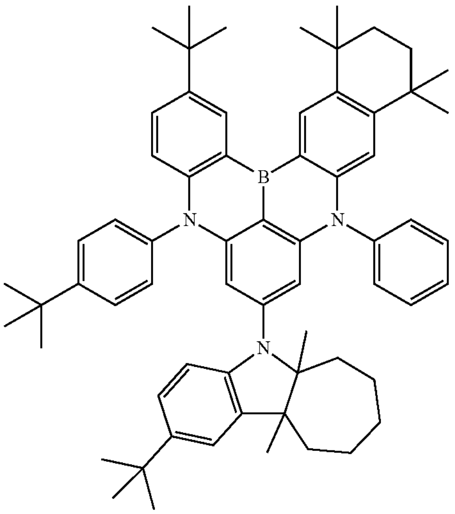

-continued
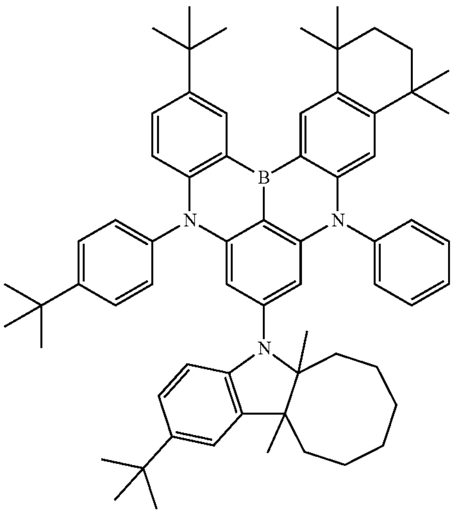
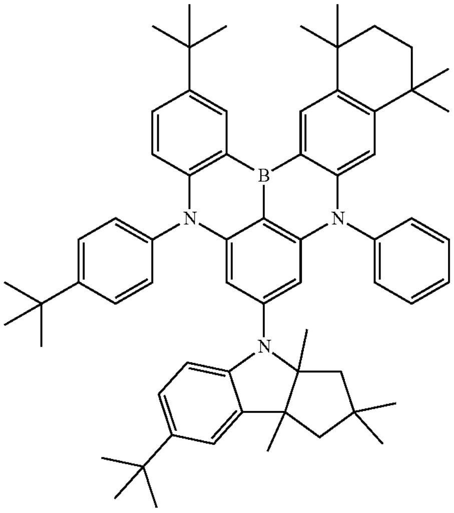
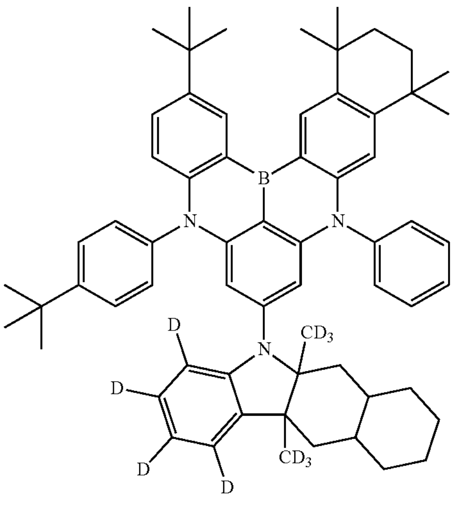
-continued
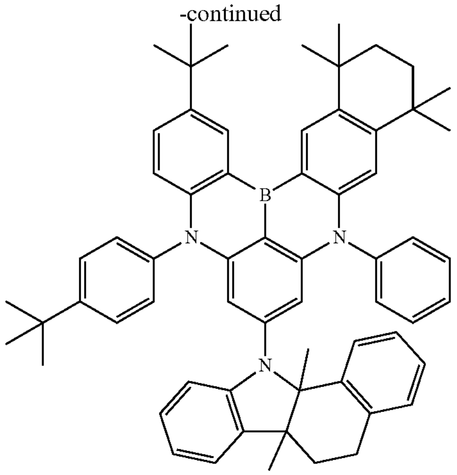
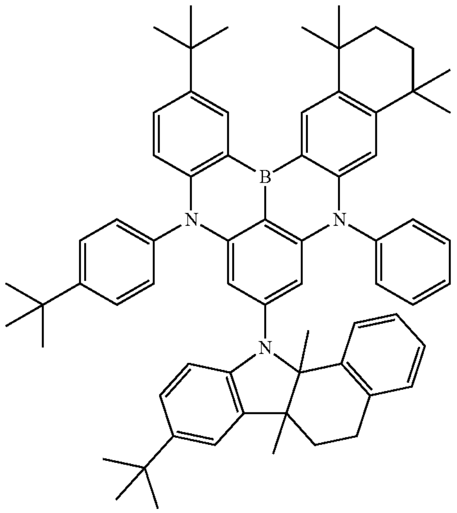
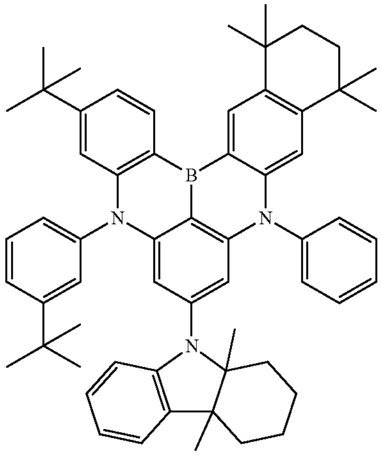

-continued
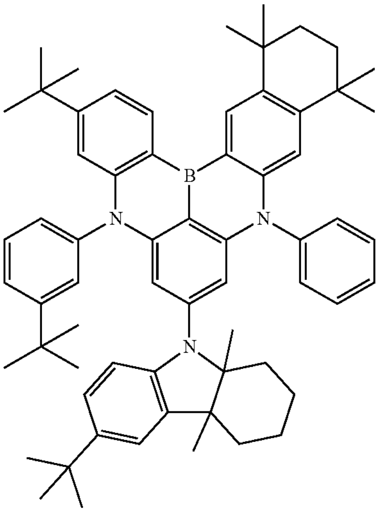
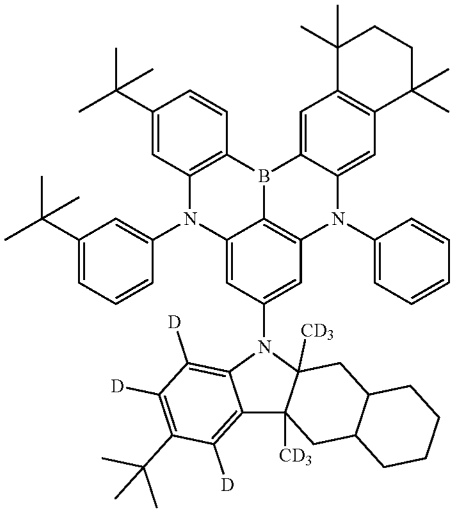
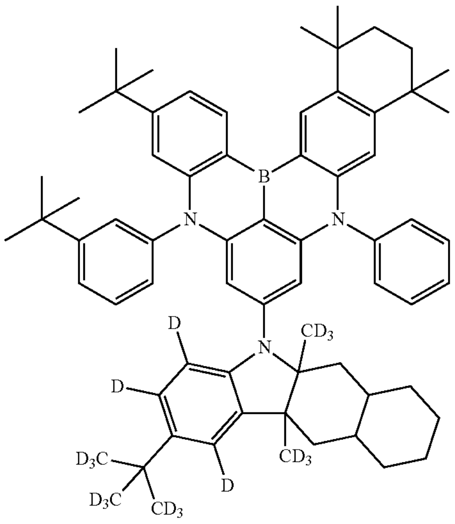
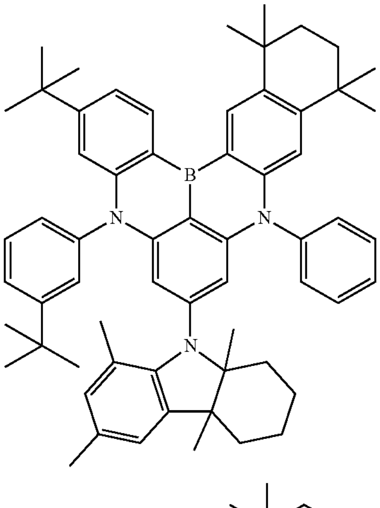
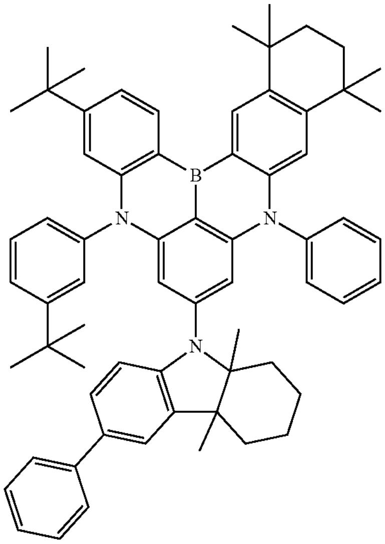
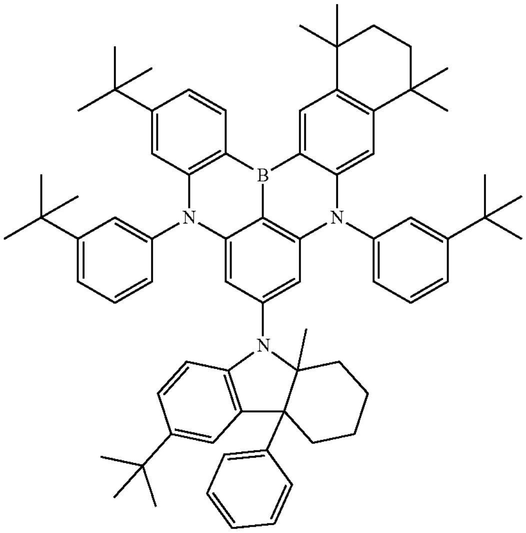
-continued -continued
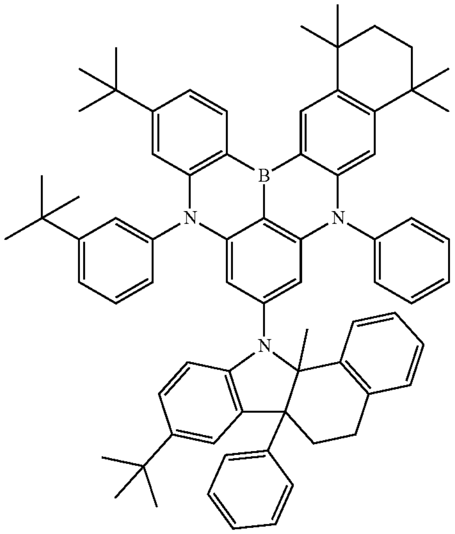
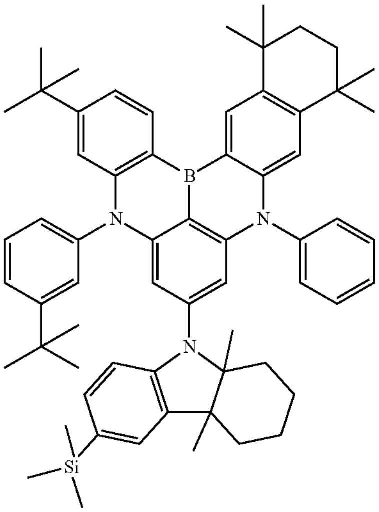
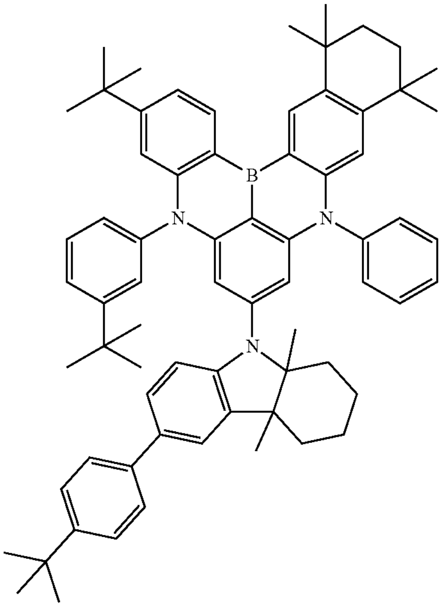
-continued
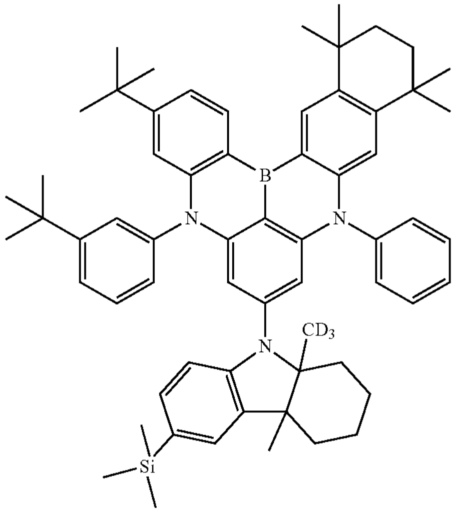
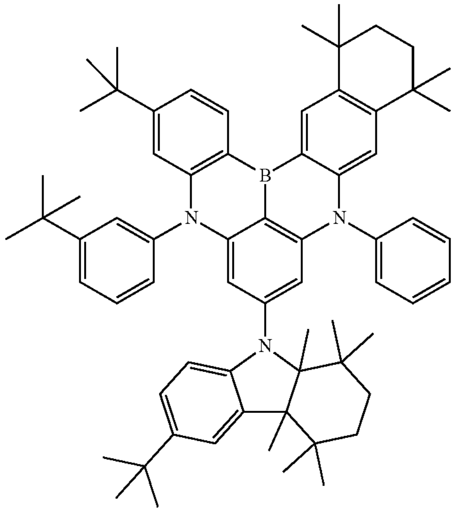
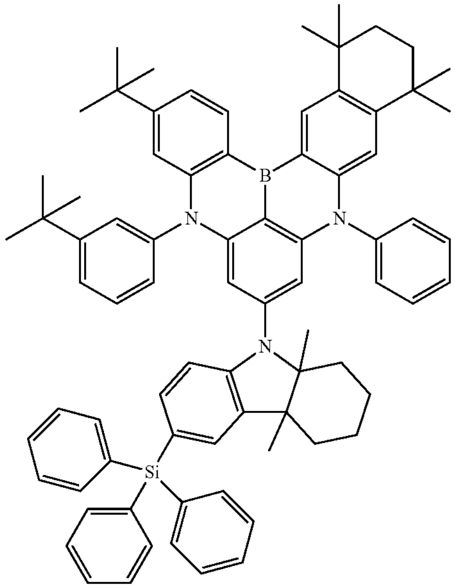

-continued
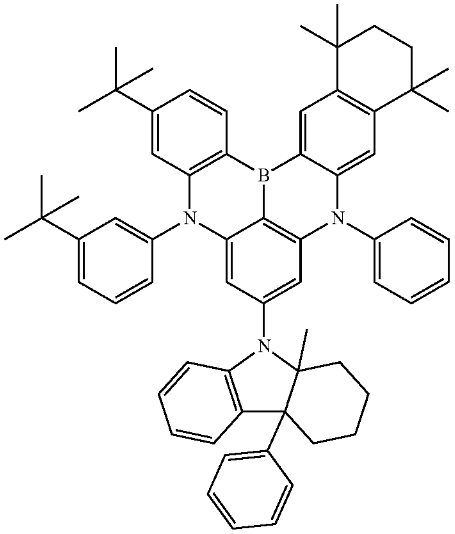
-continued
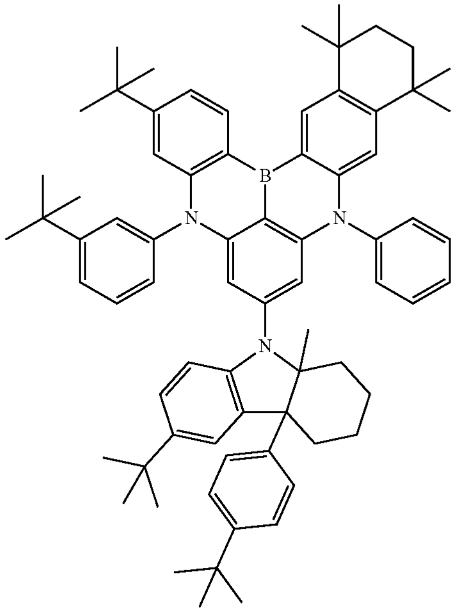
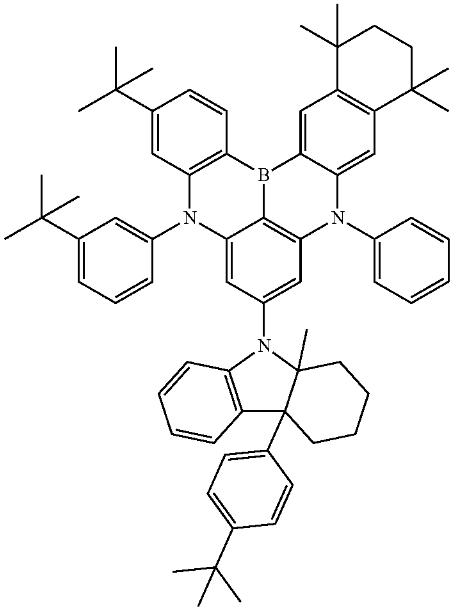
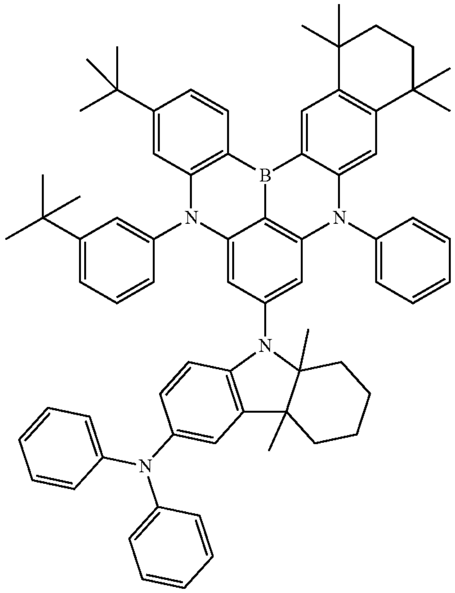

-continued
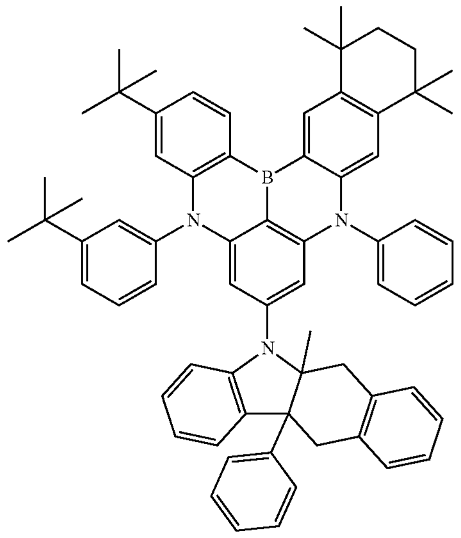
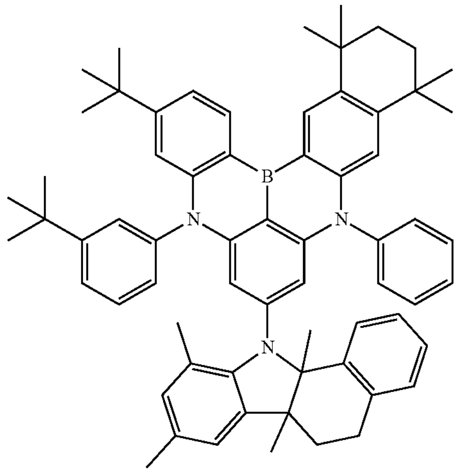
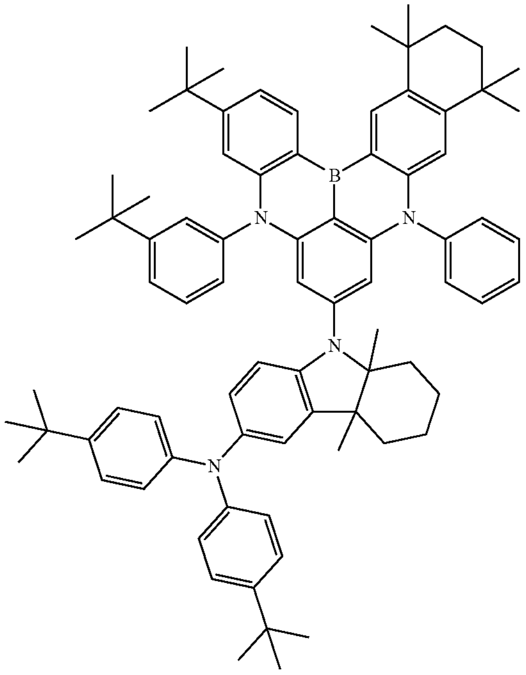
-continued
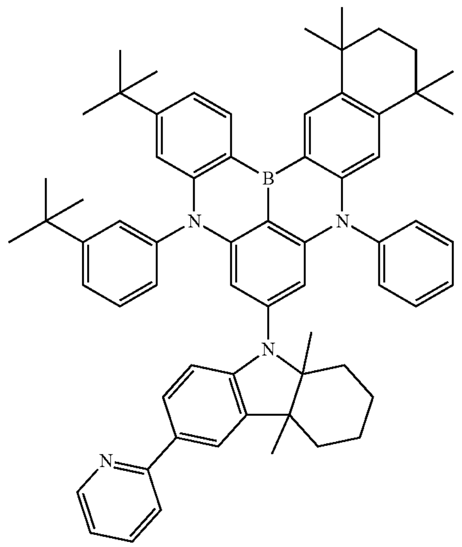
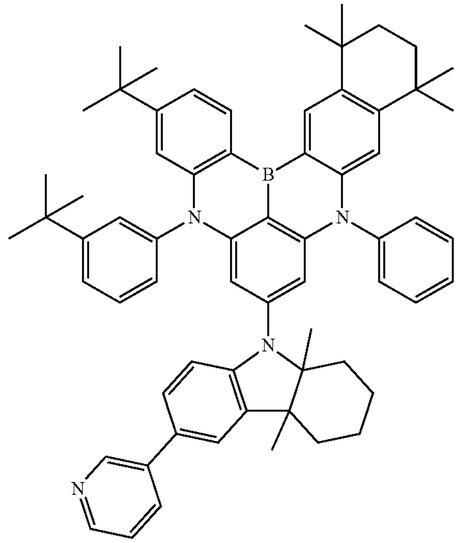
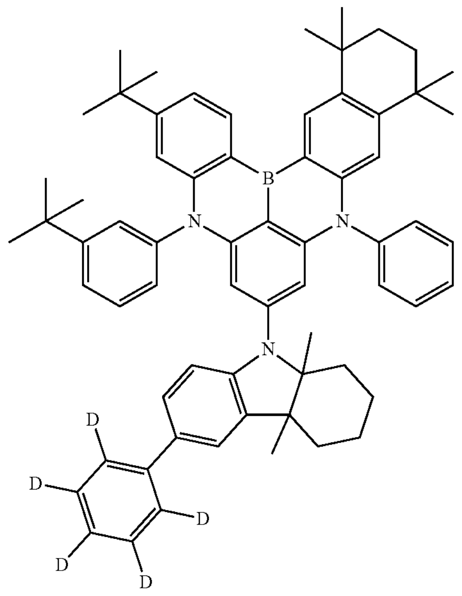

-continued
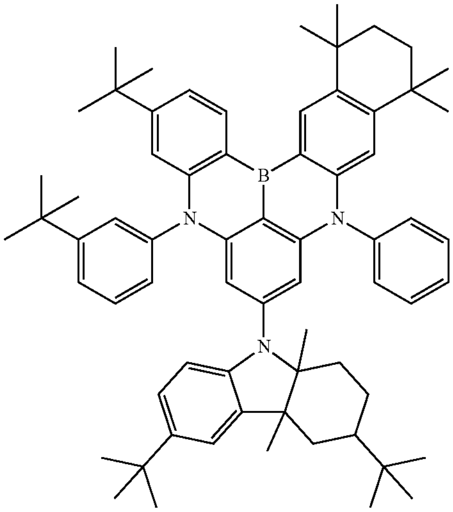
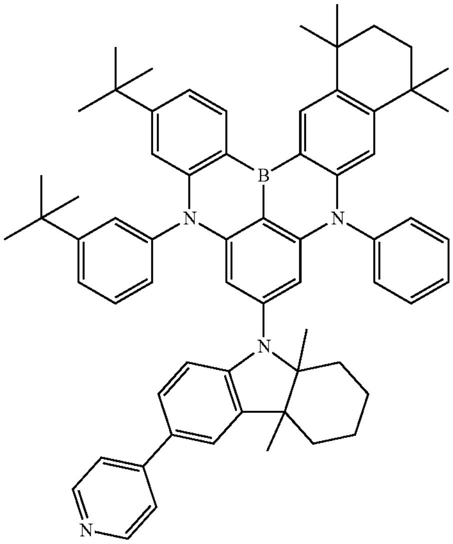
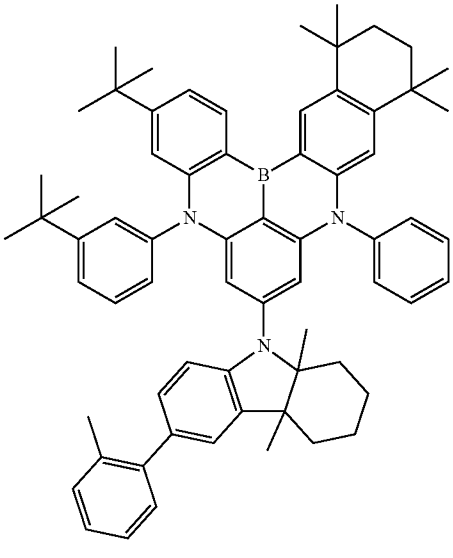
-continued
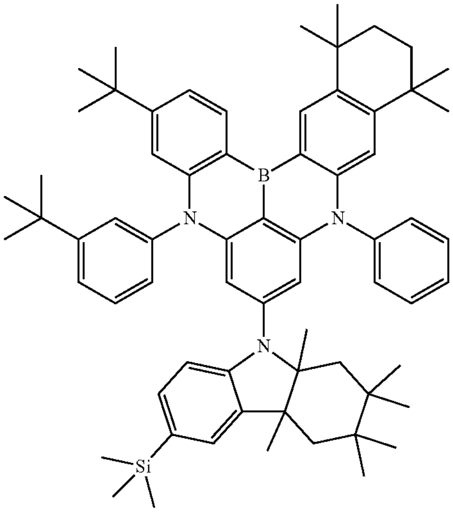
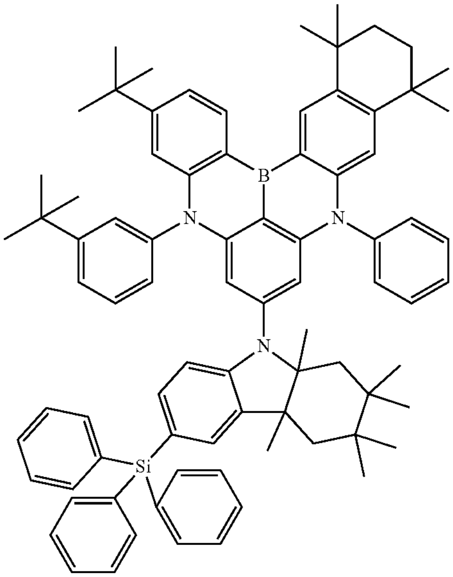
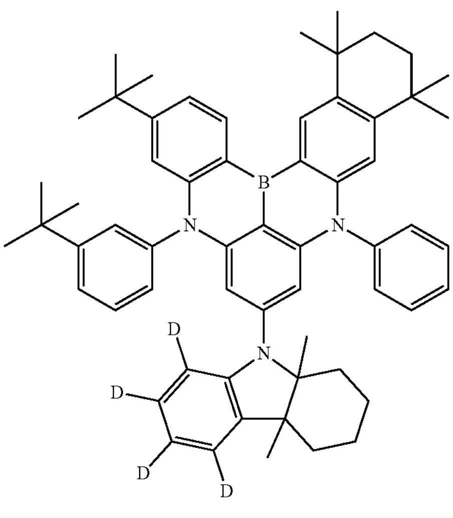

-continued
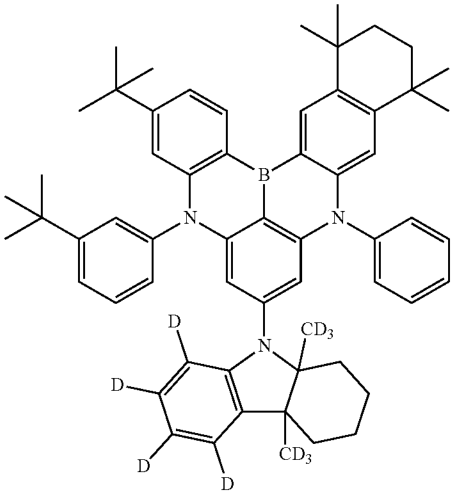
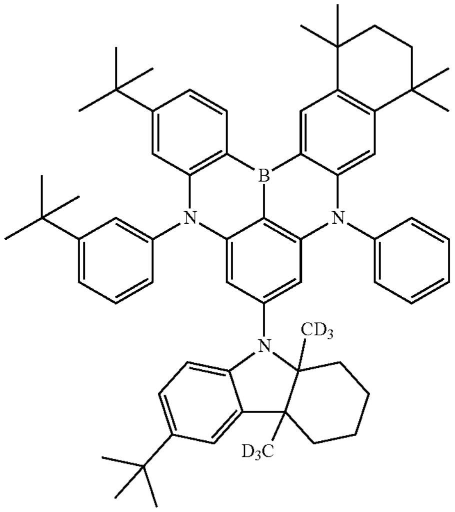
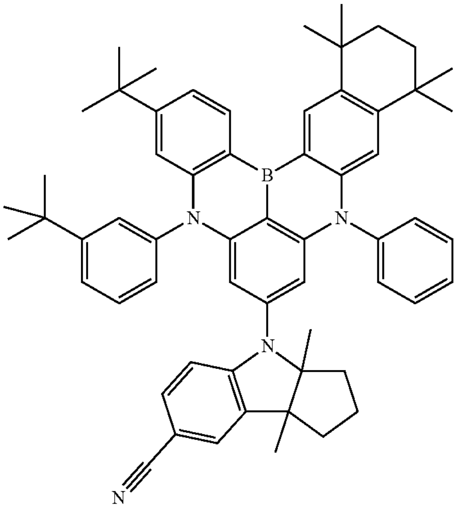
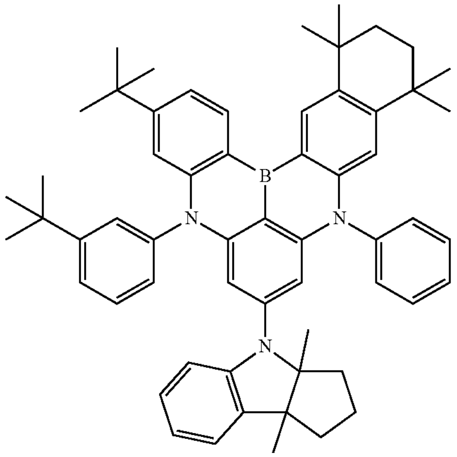
-continued
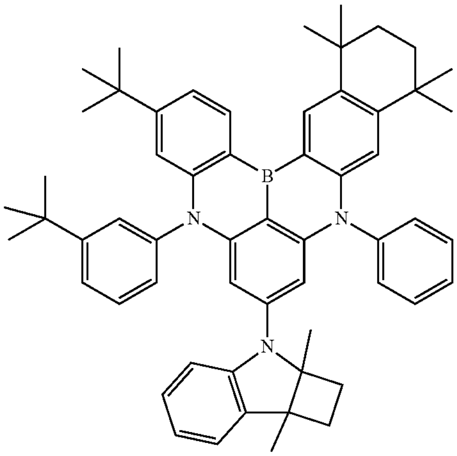
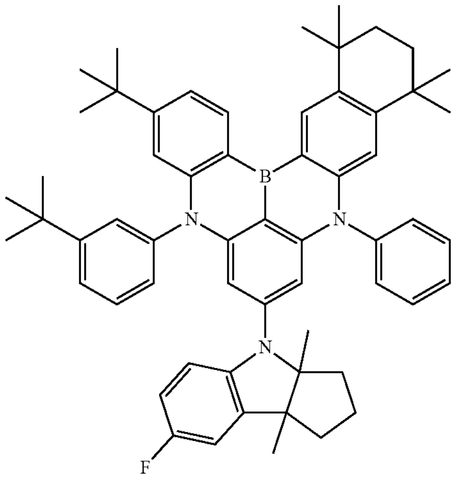

-continued
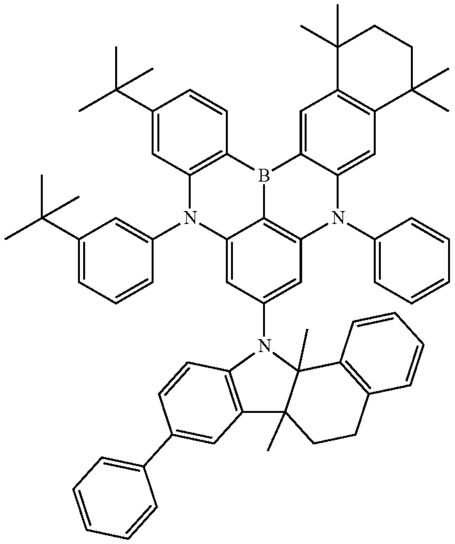
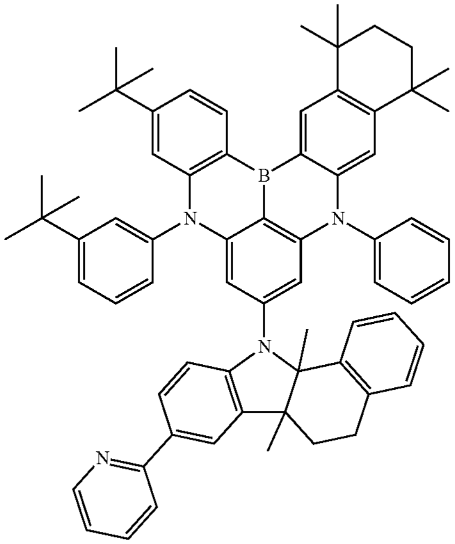
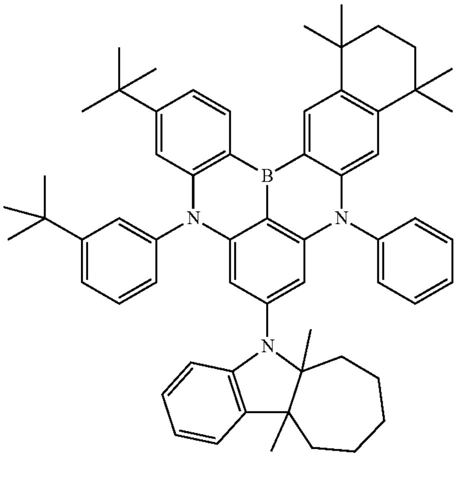
-continued
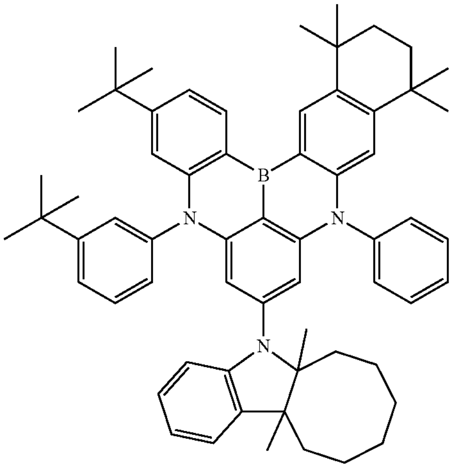
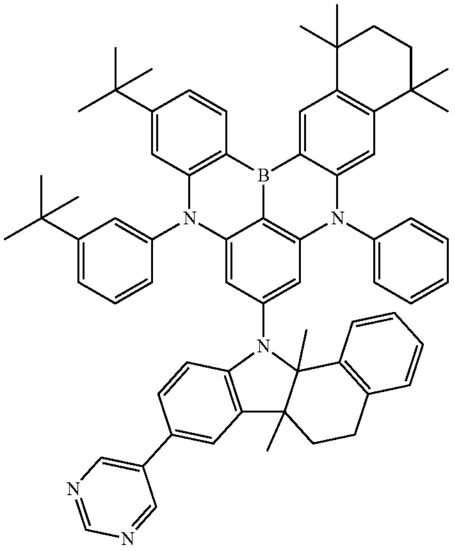
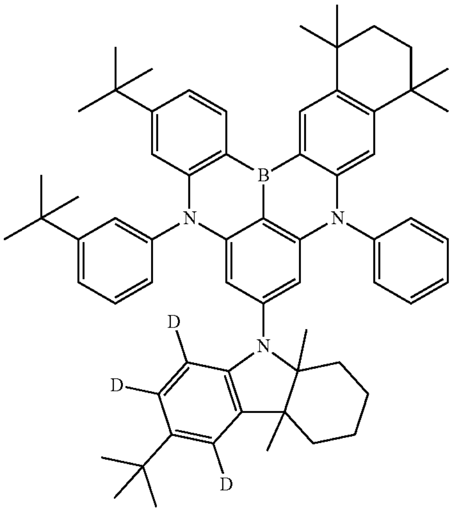

-continued
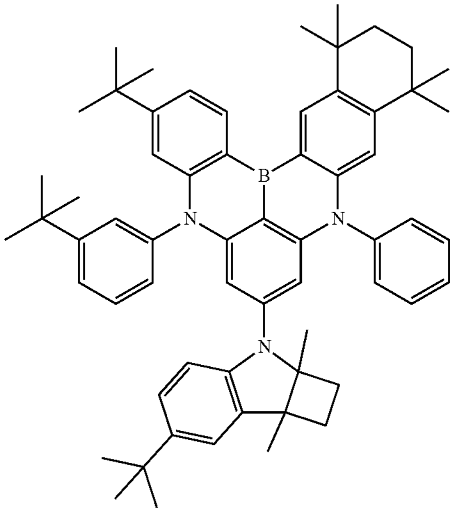
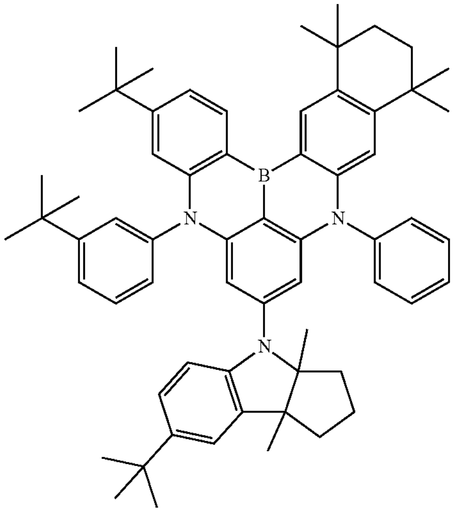
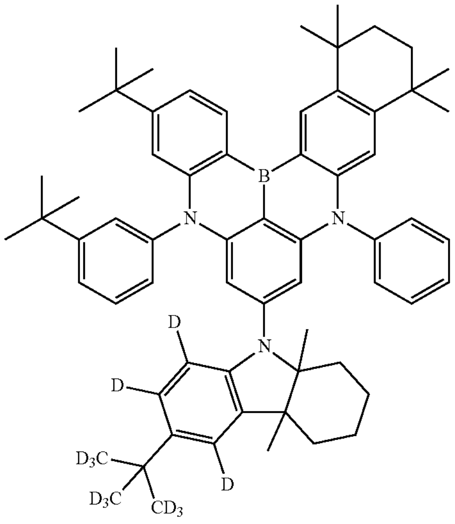
-continued
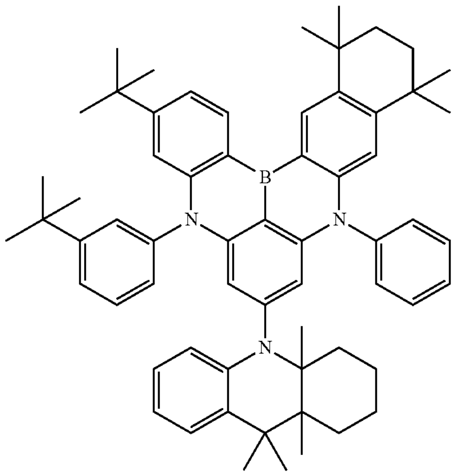
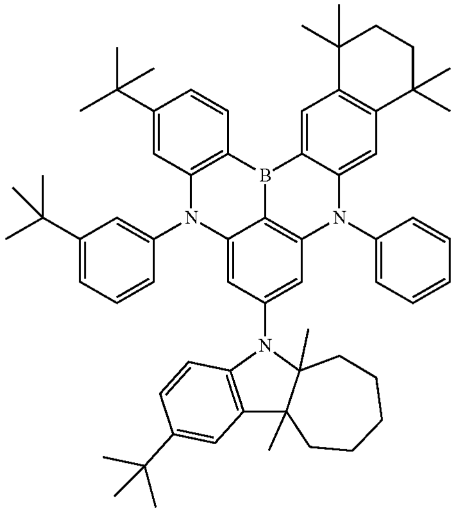
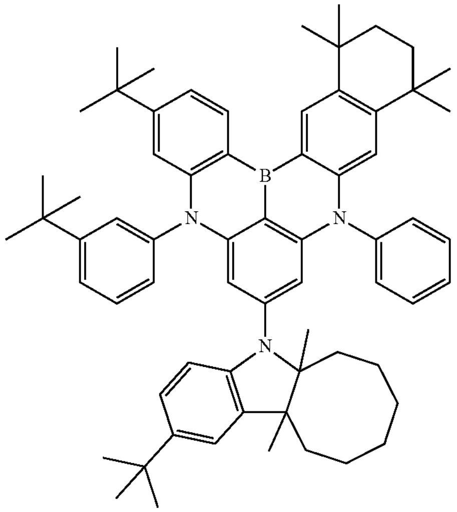

-continued
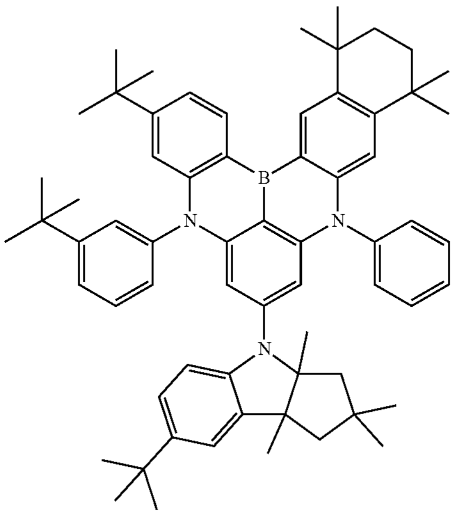
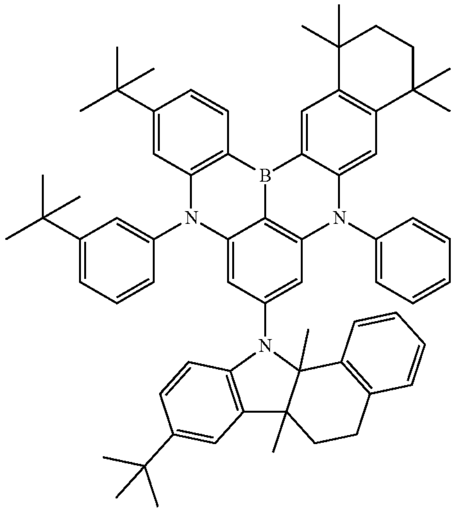
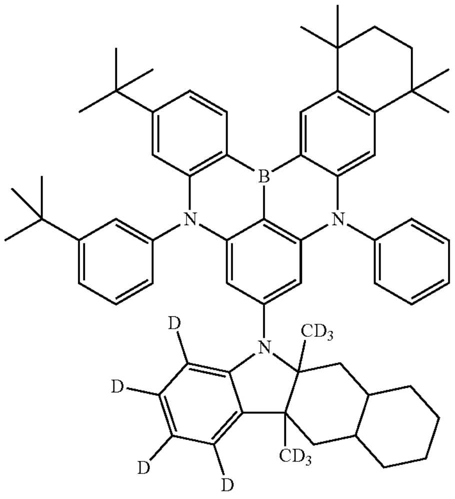
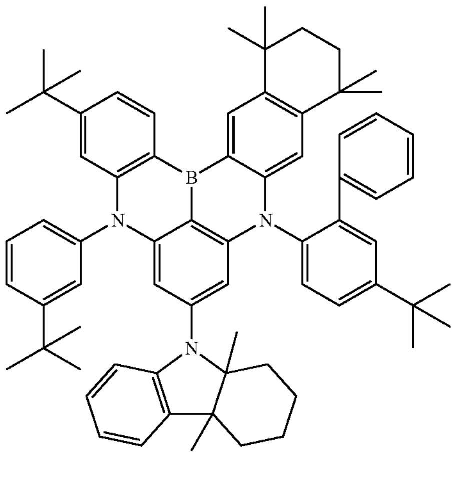
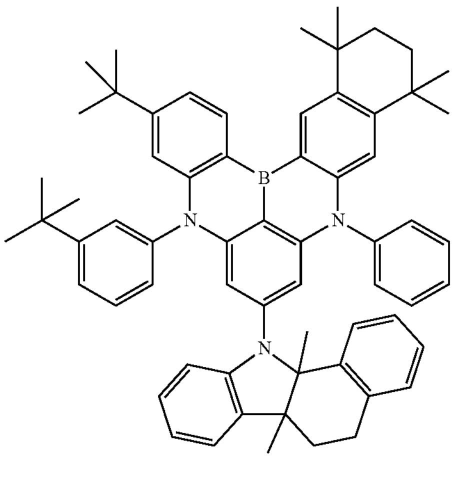
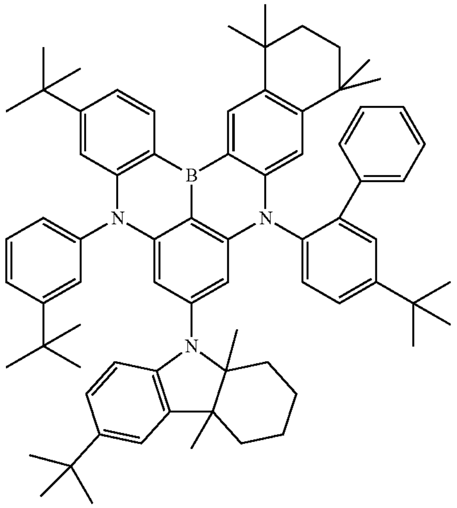
-continued -continued
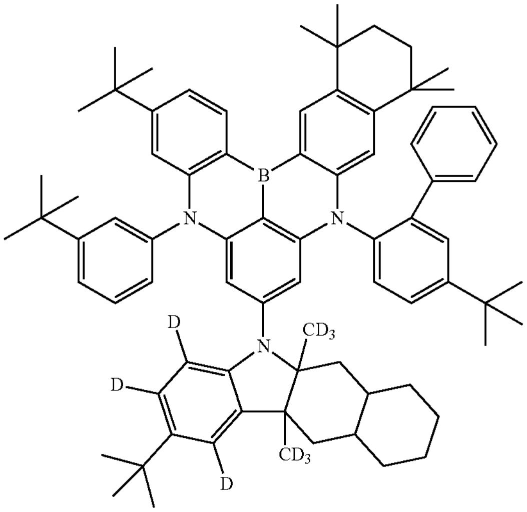
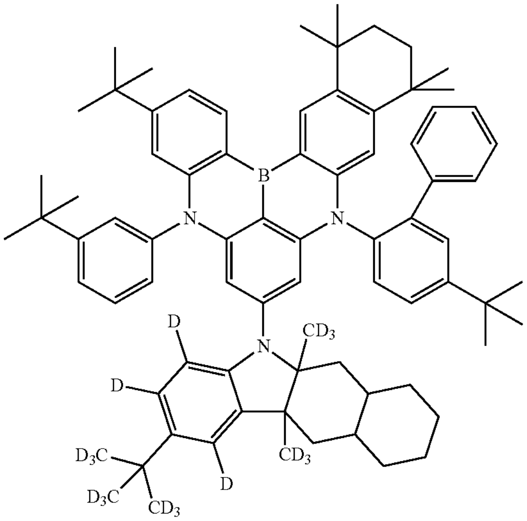
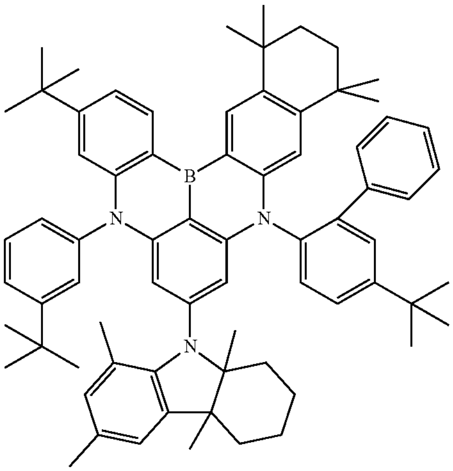
-continued
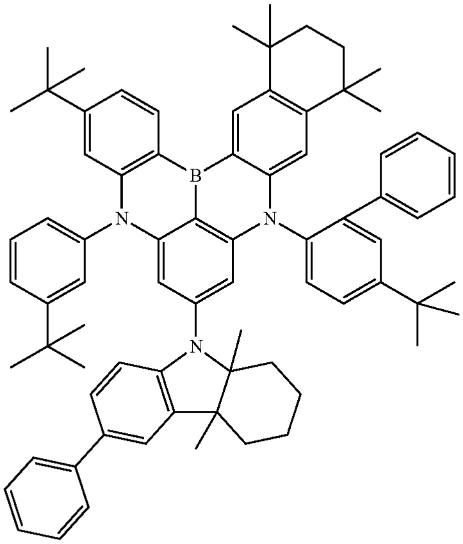
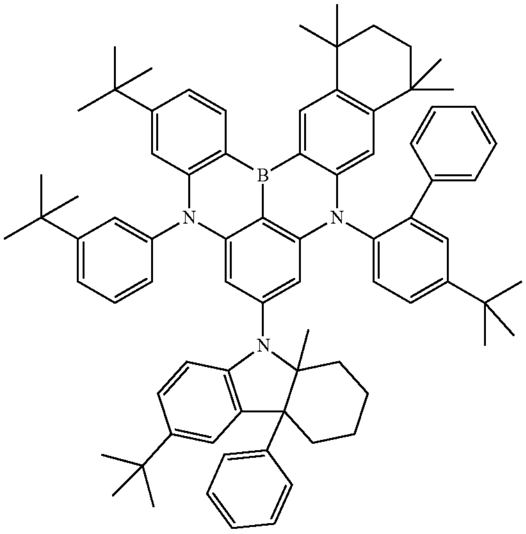
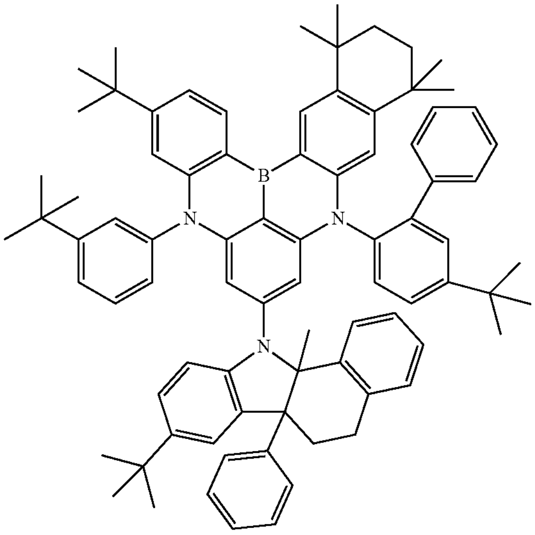

-continued
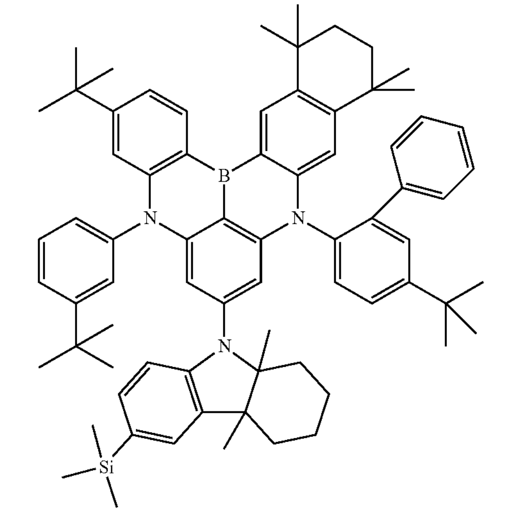
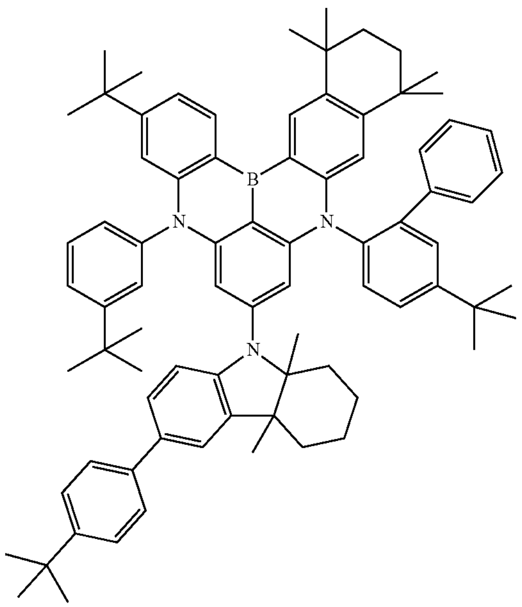
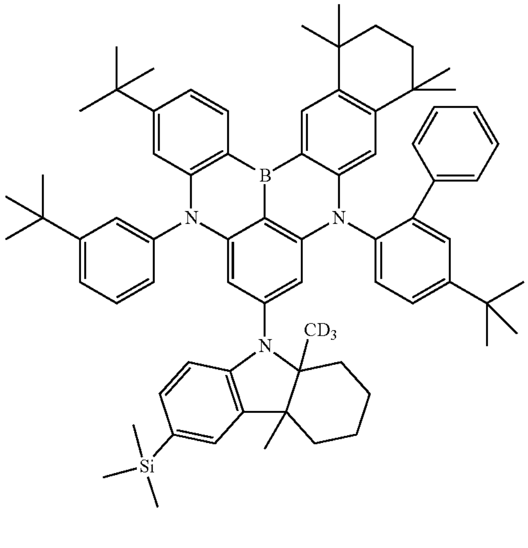
-continued
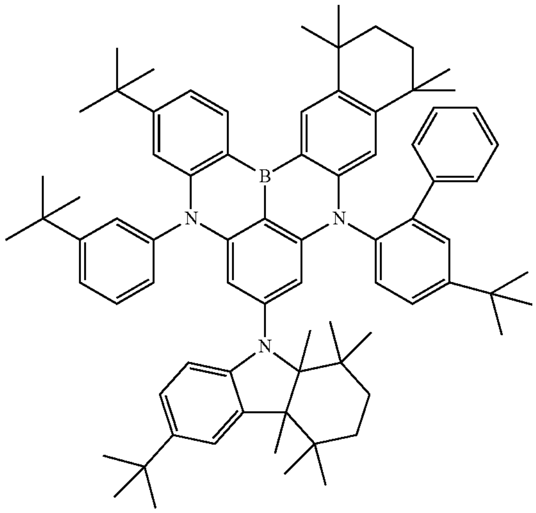
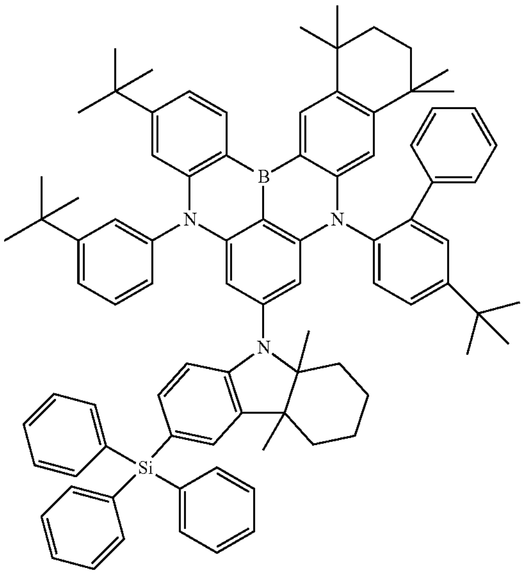
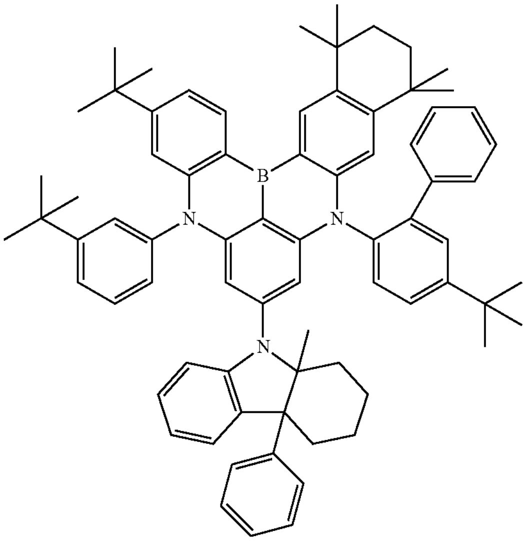

-continued
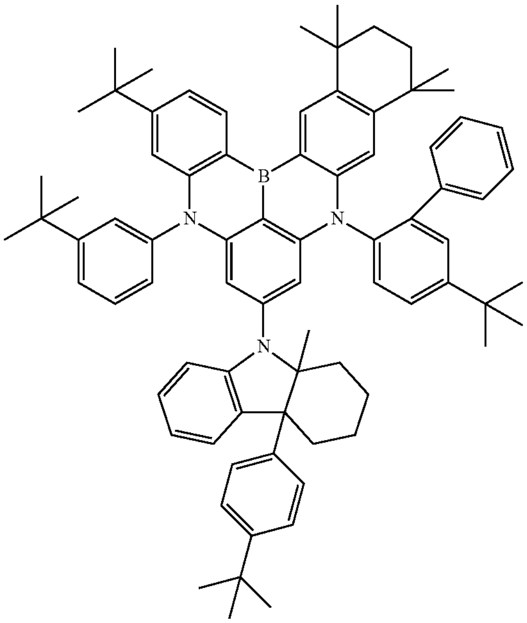
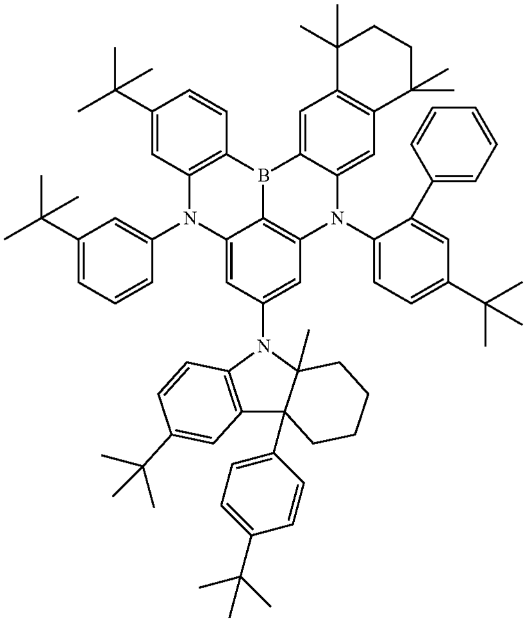
-continued
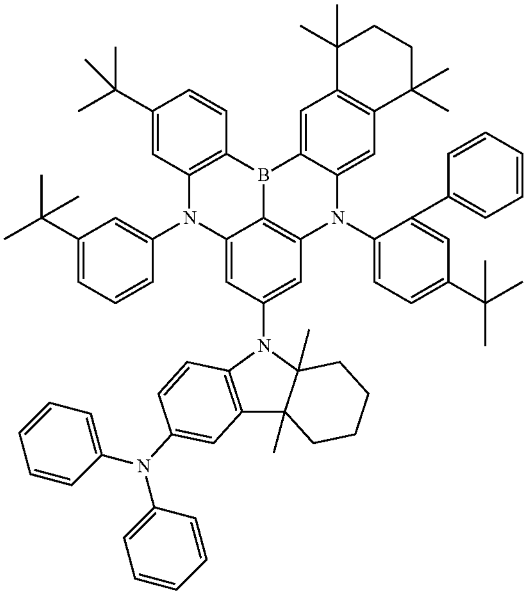
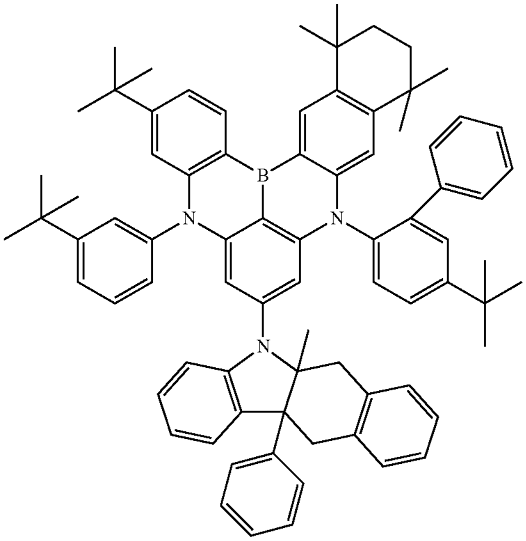
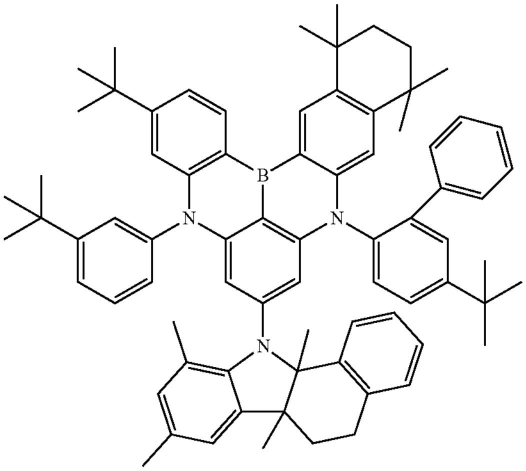

-continued
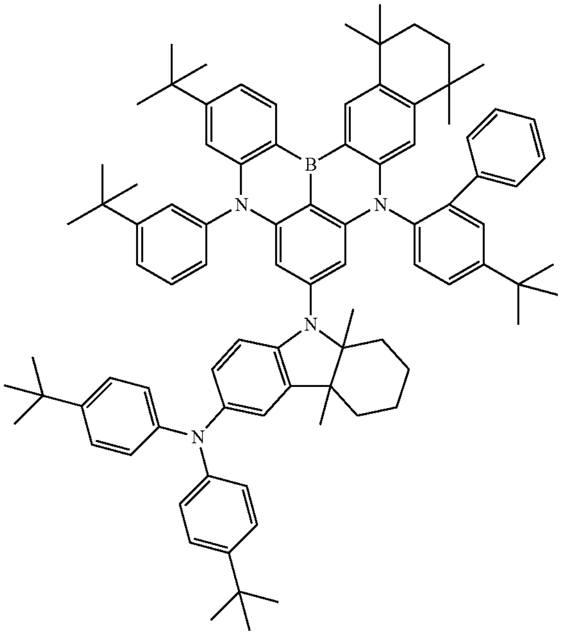
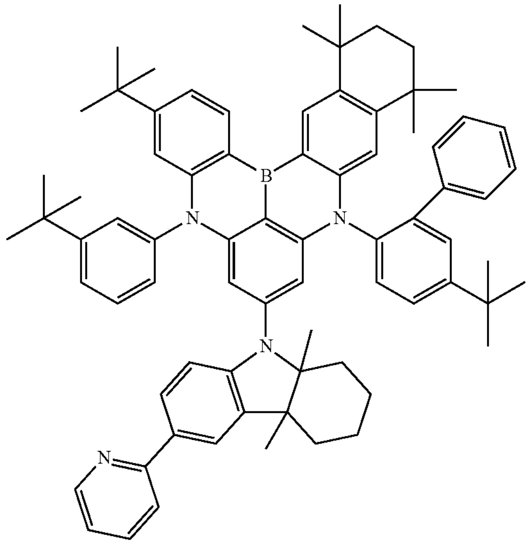
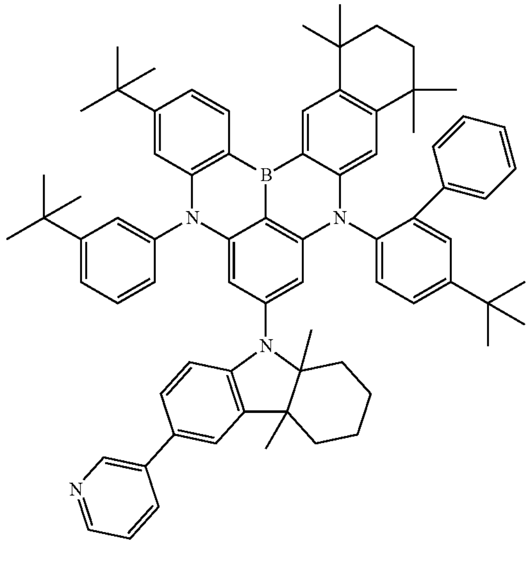
-continued
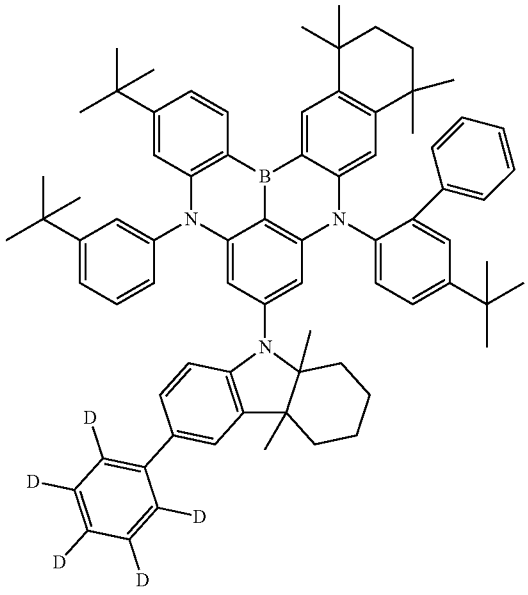
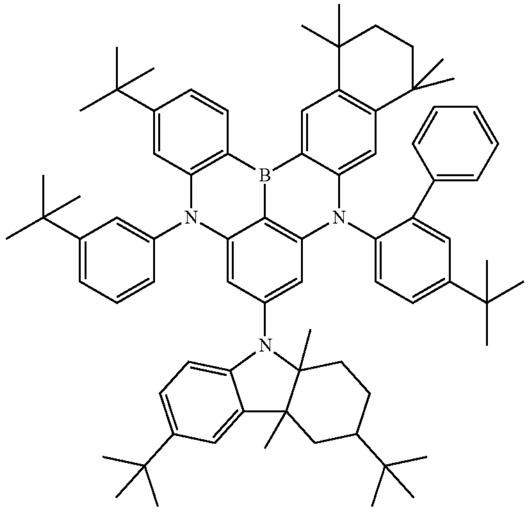
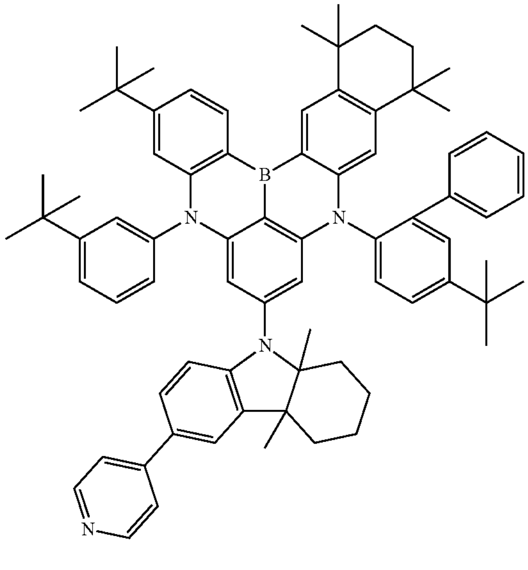

-continued
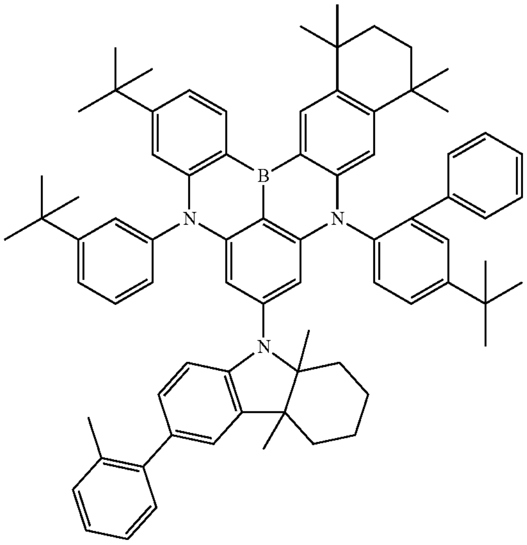
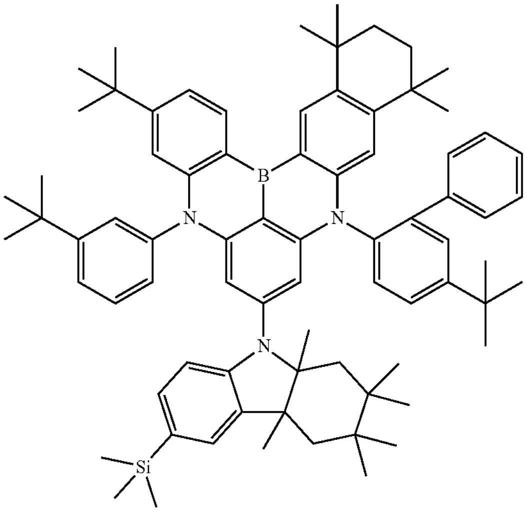
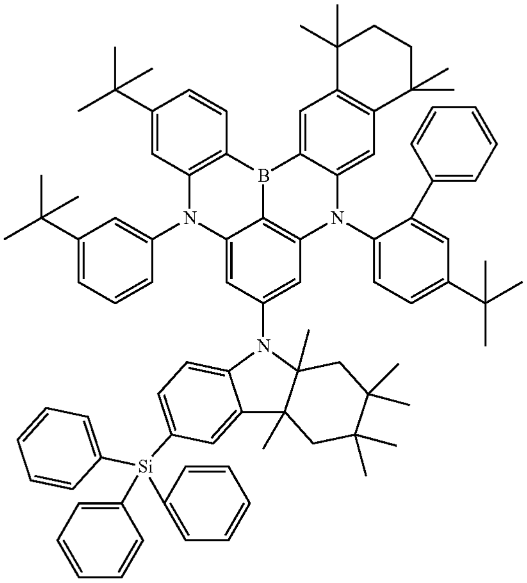
-continued
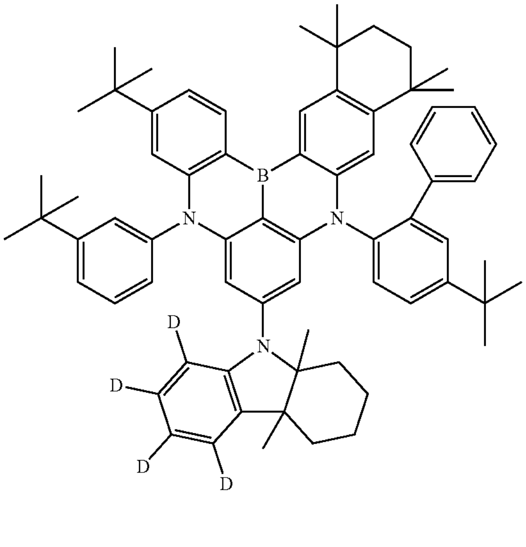
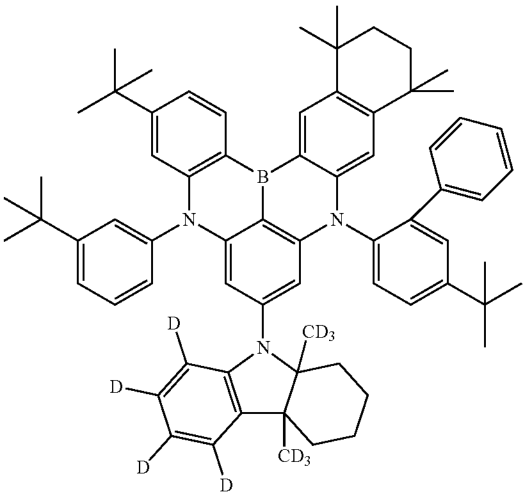
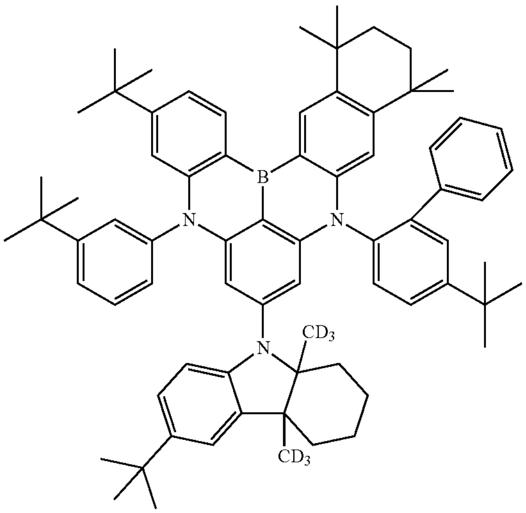

-continued
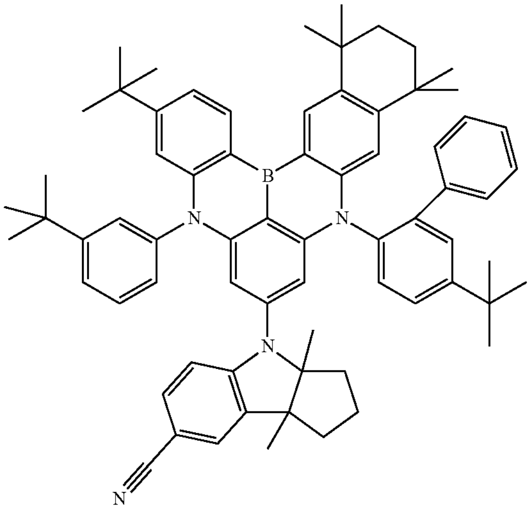
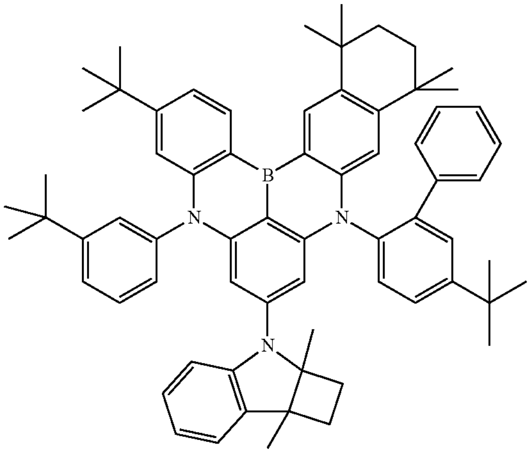
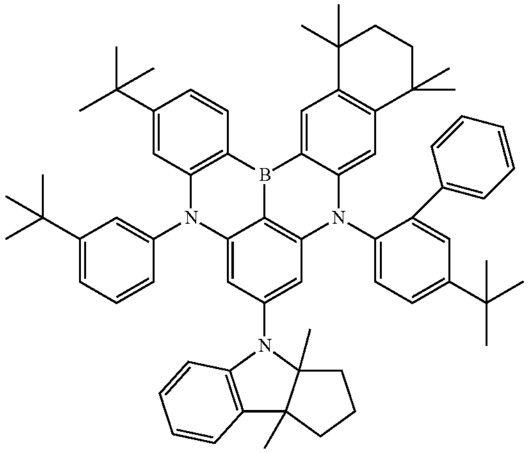
-continued
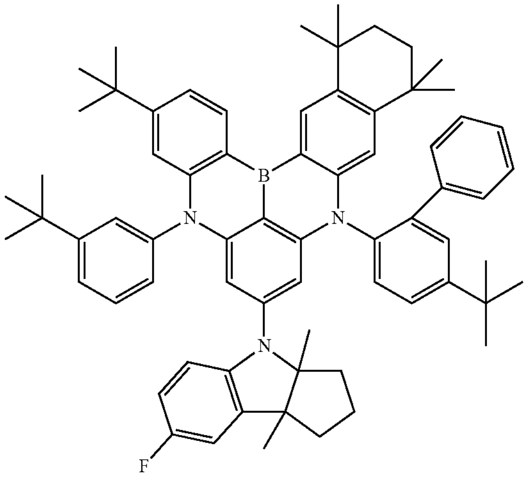
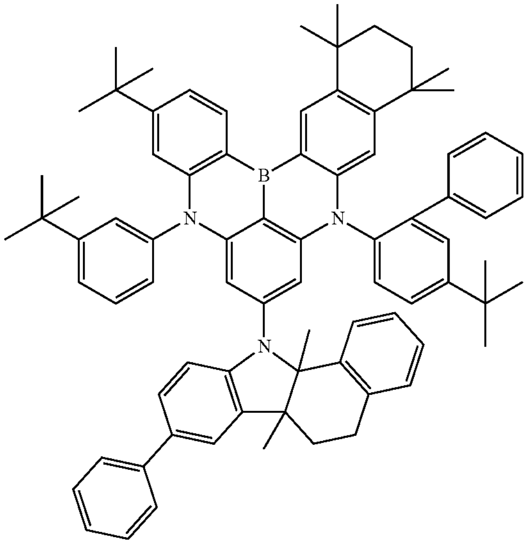
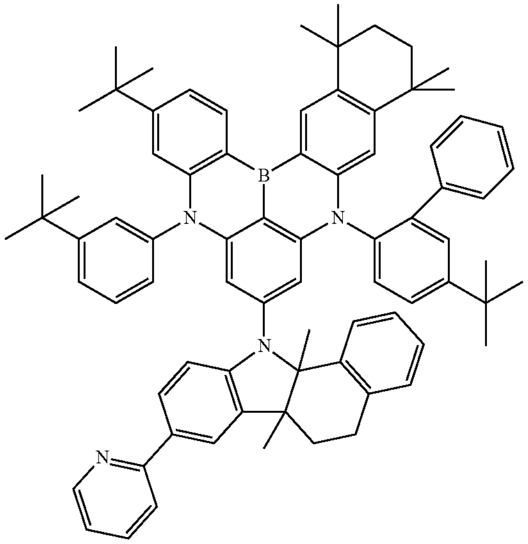

-continued
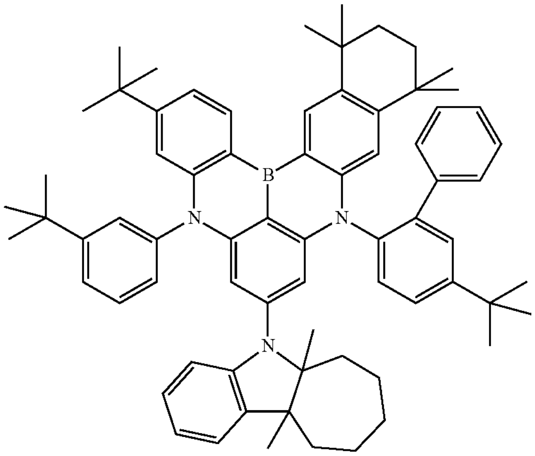
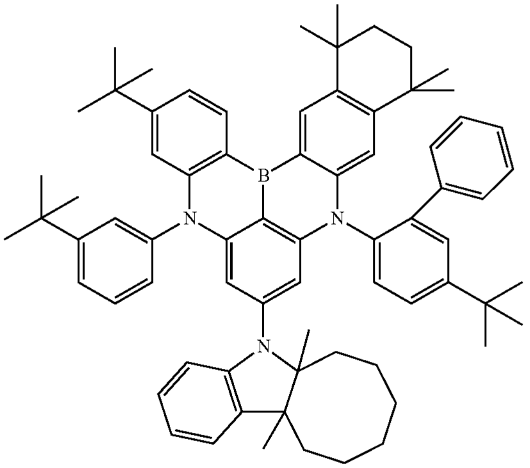
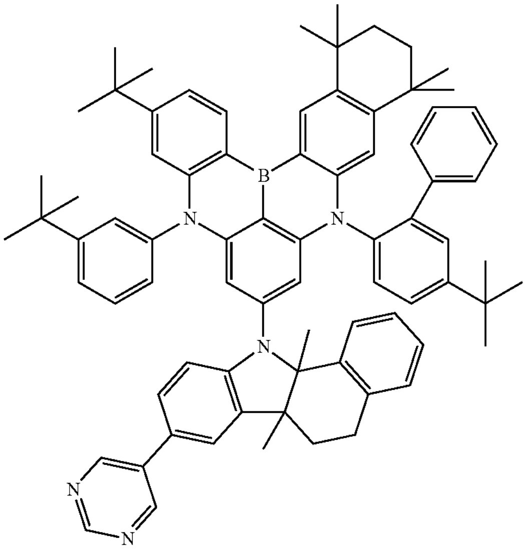
-continued
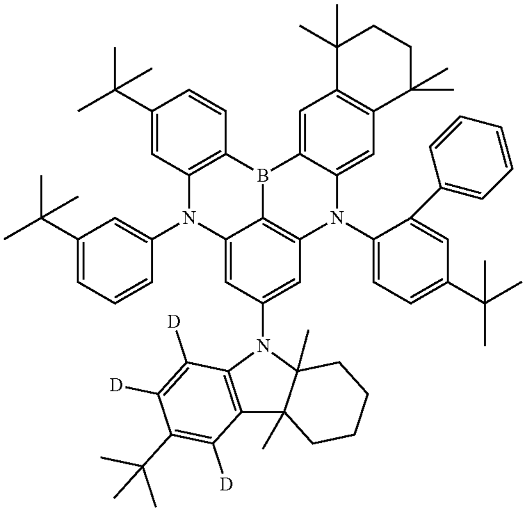
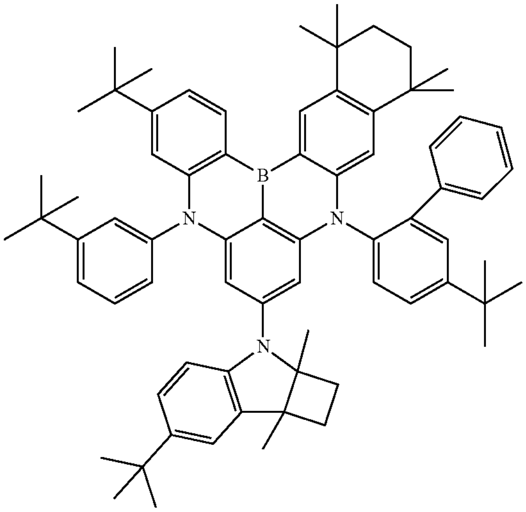
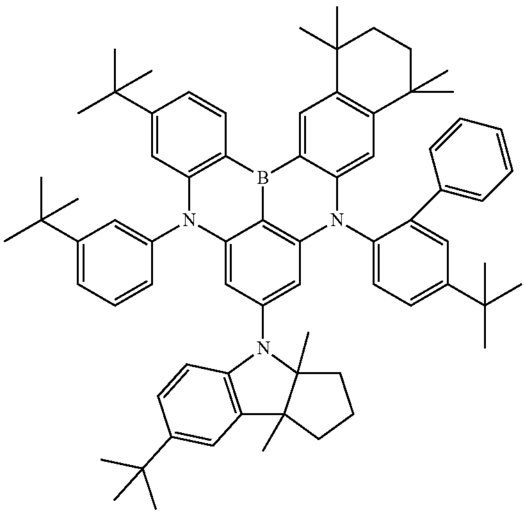

-continued
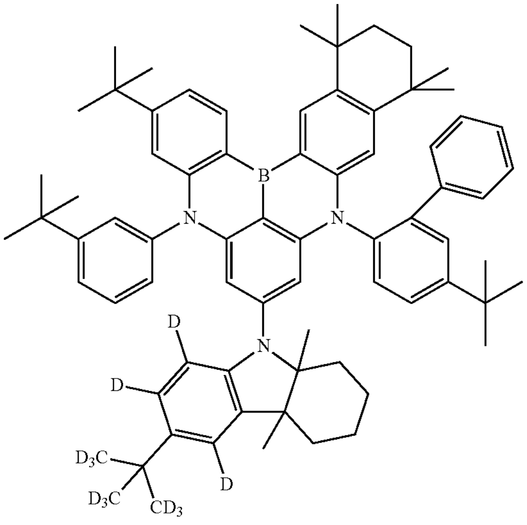
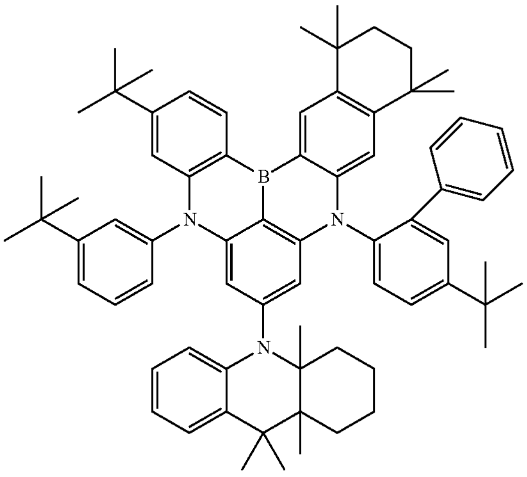
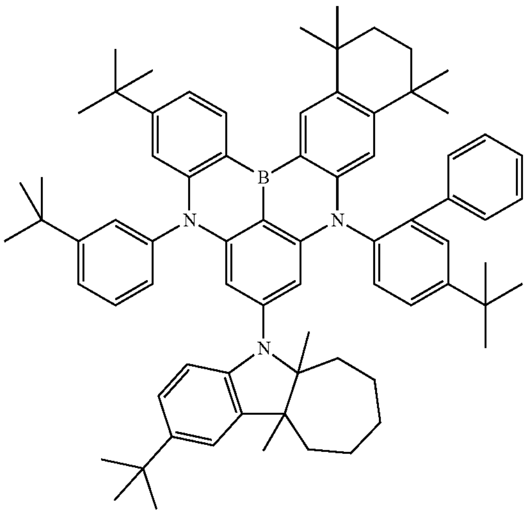
-continued
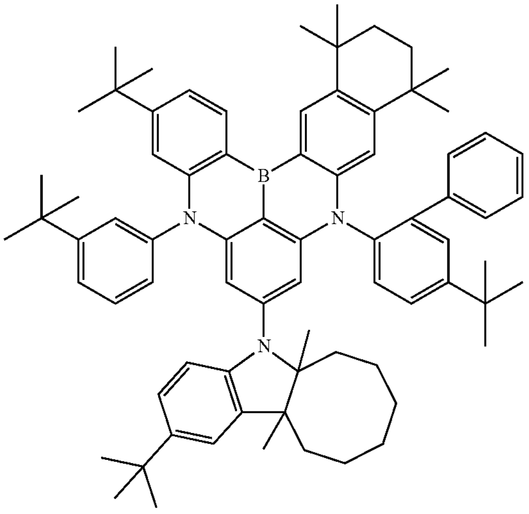
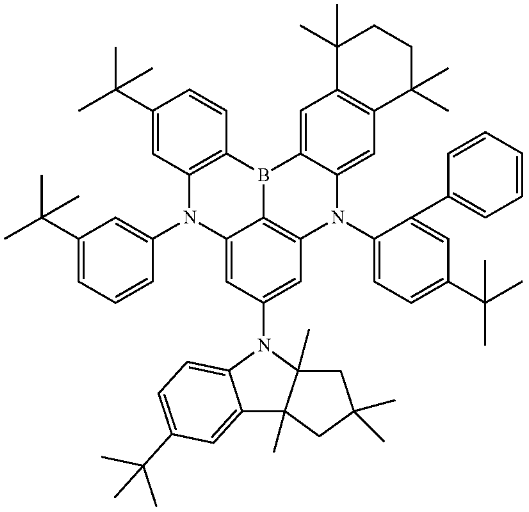
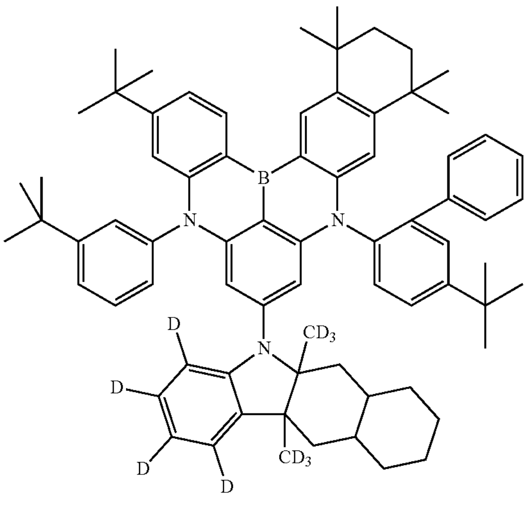

-continued
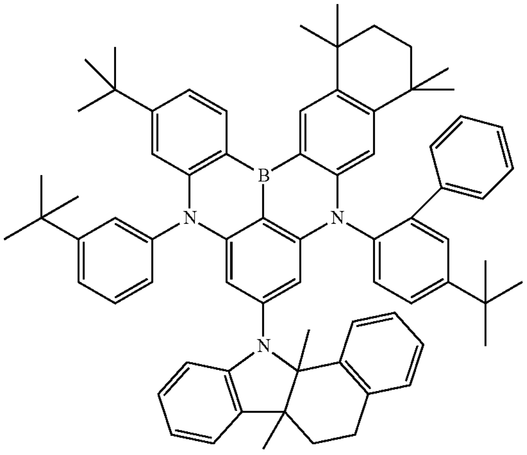
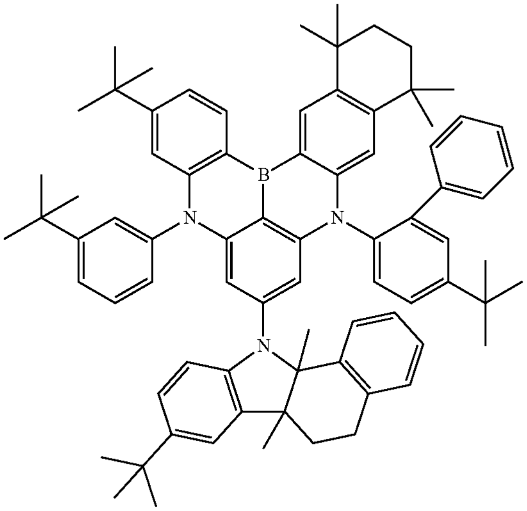
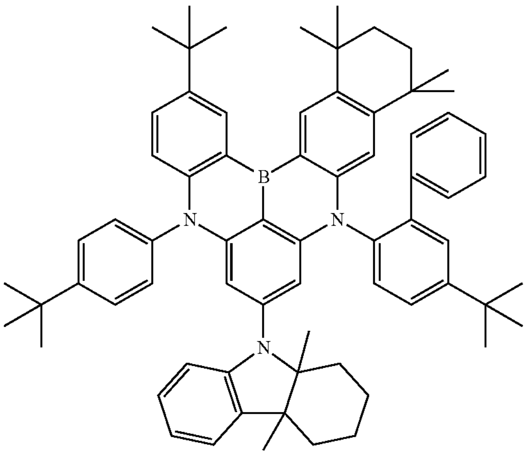
-continued
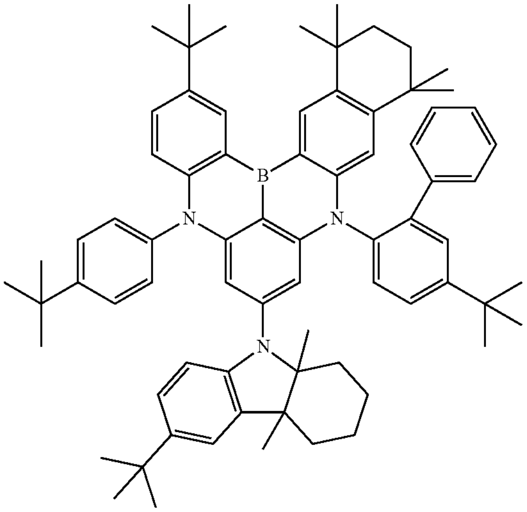
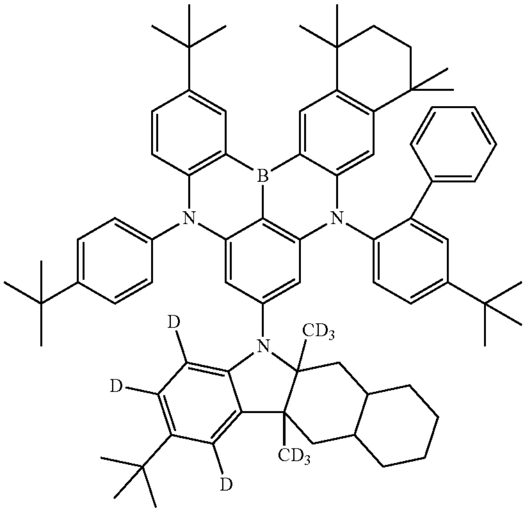
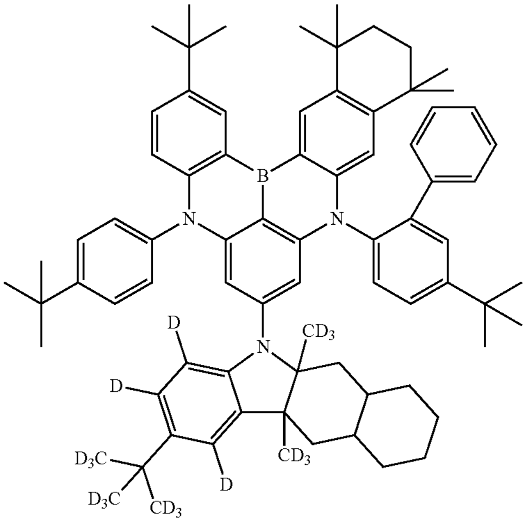

-continued
-continued
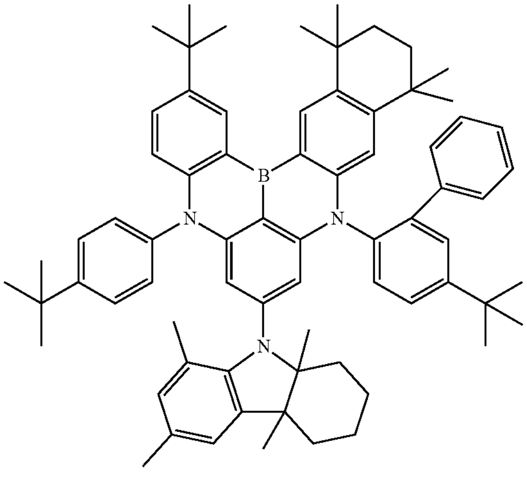
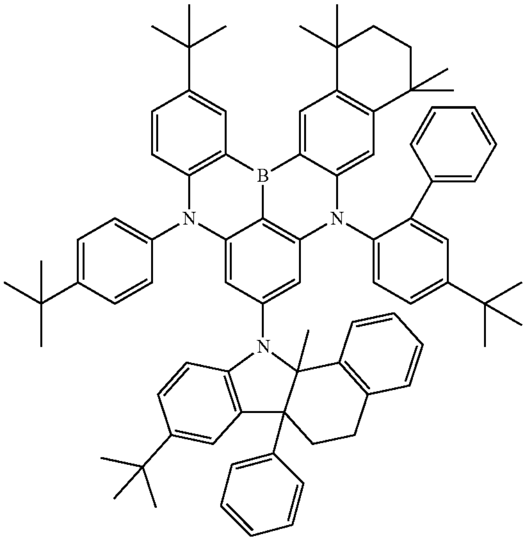
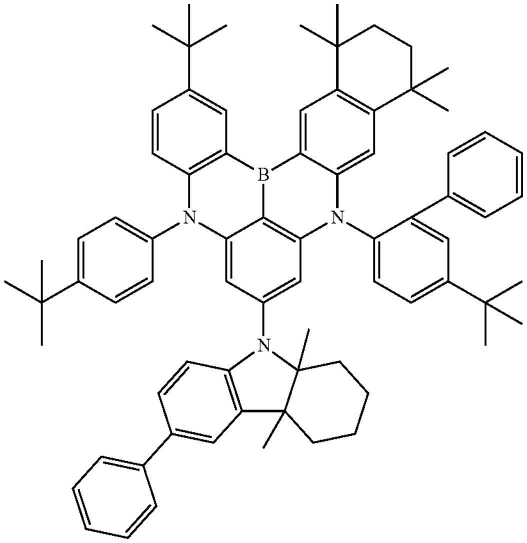
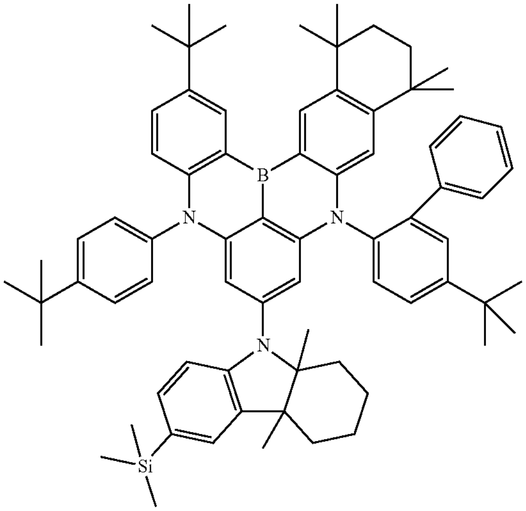
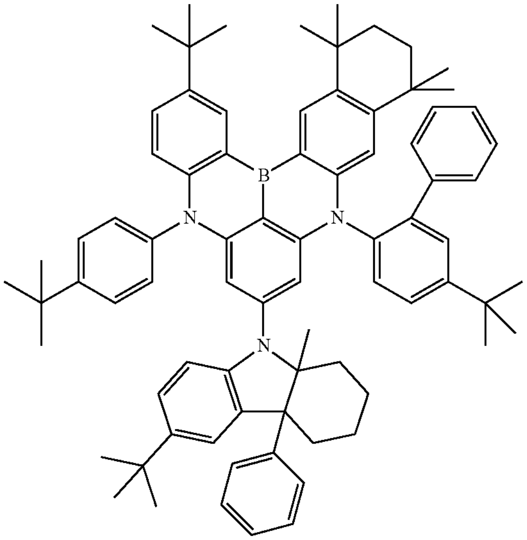
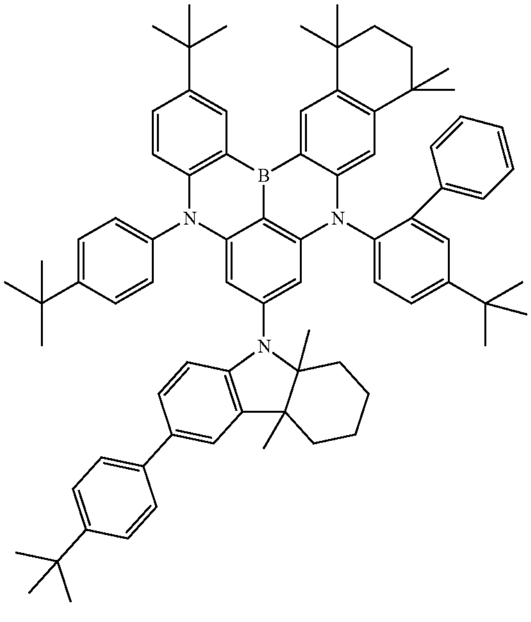

-continued
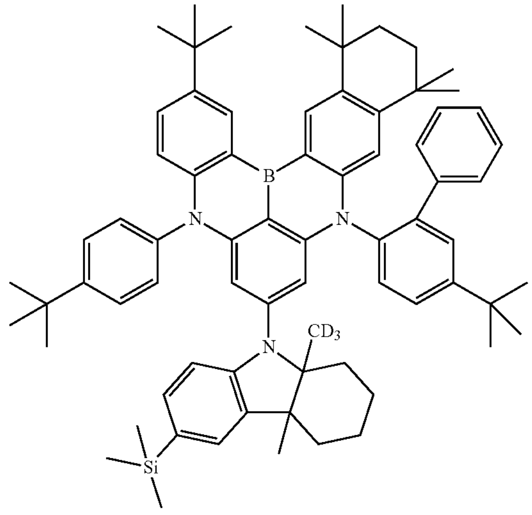
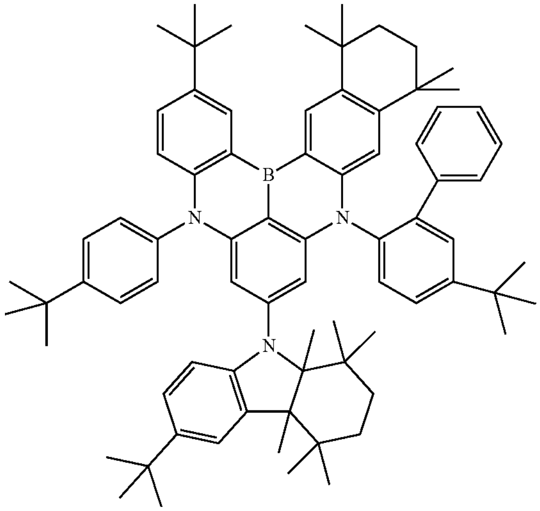
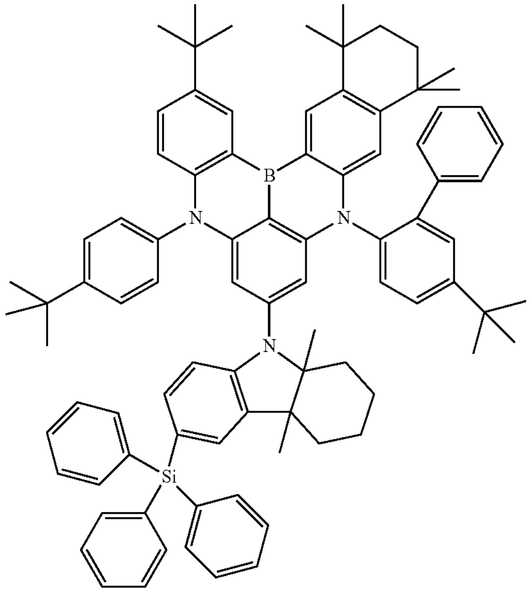
-continued
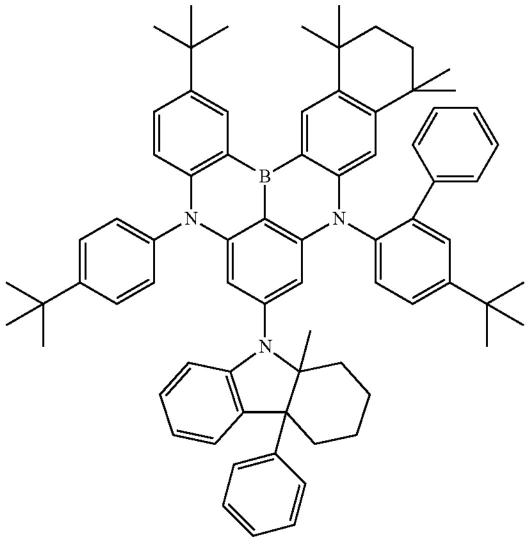
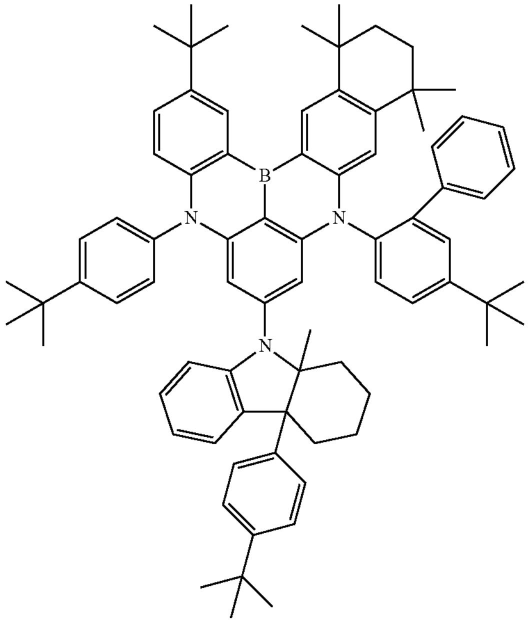

-continued
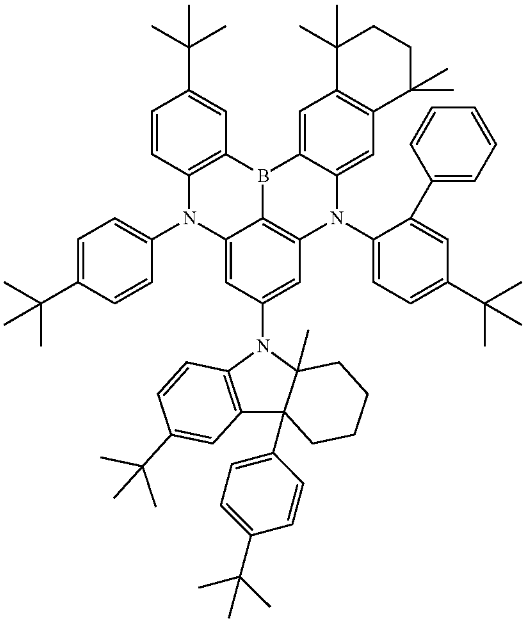
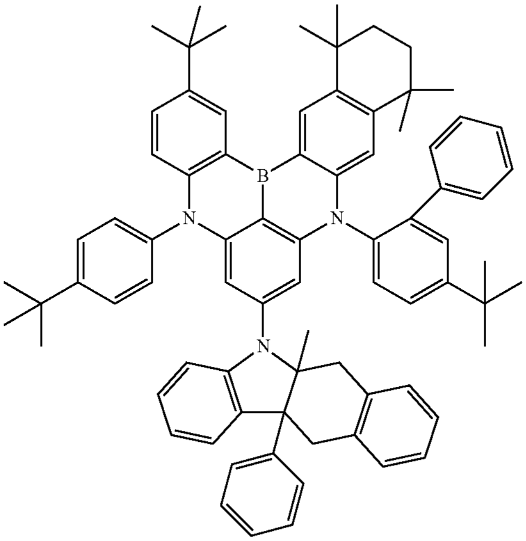
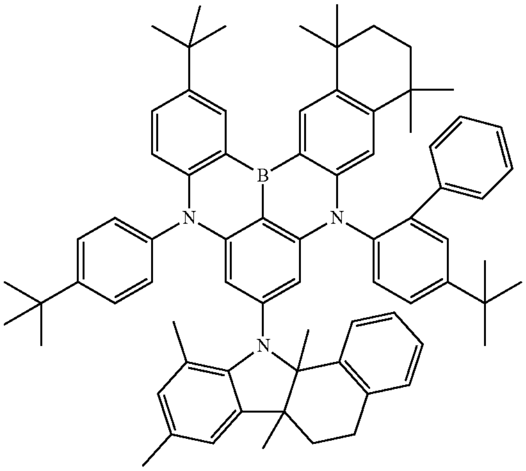
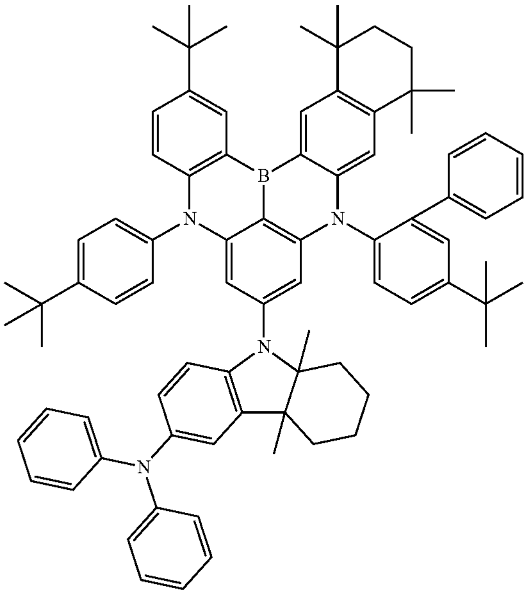
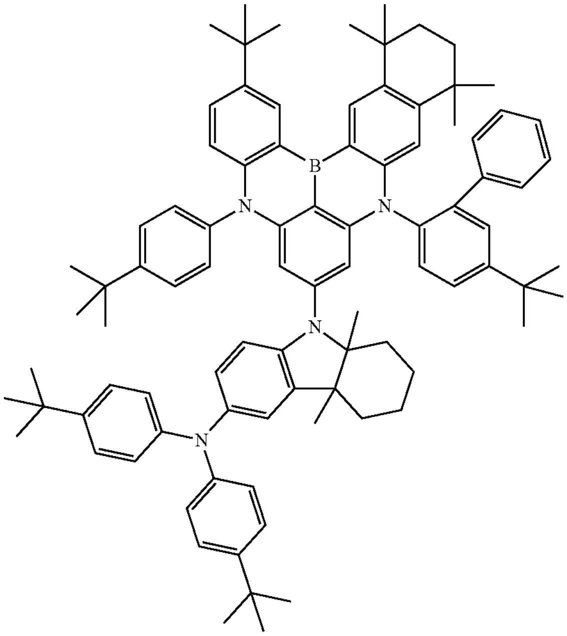

-continued
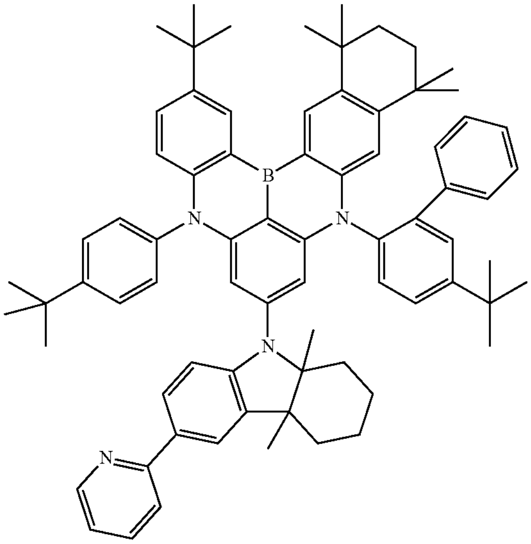
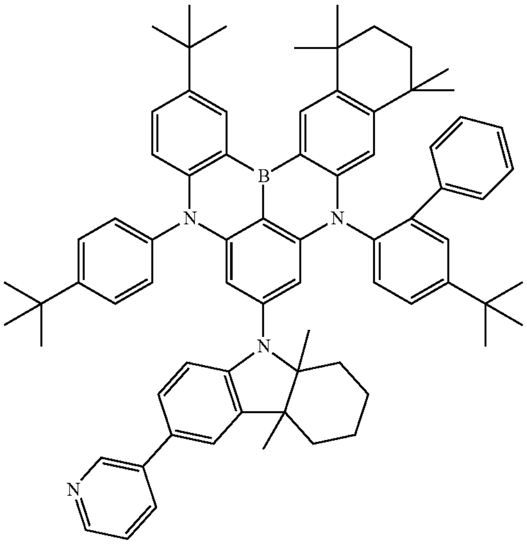
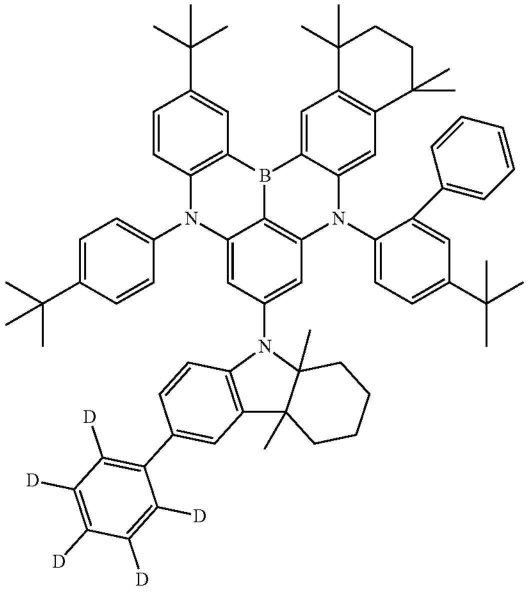
-continued
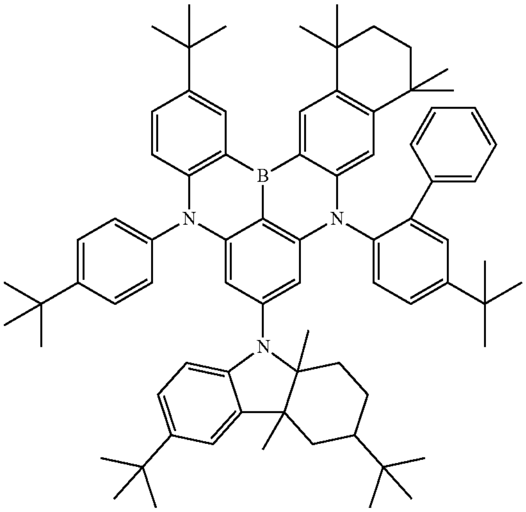
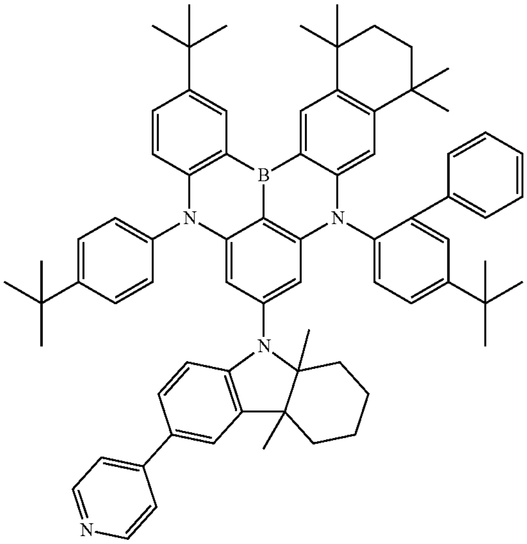
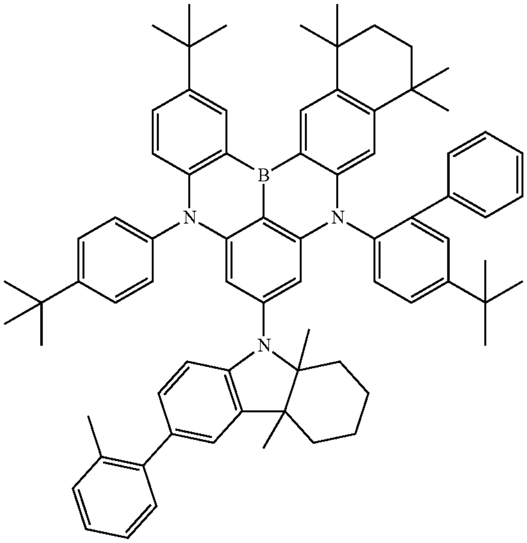

-continued
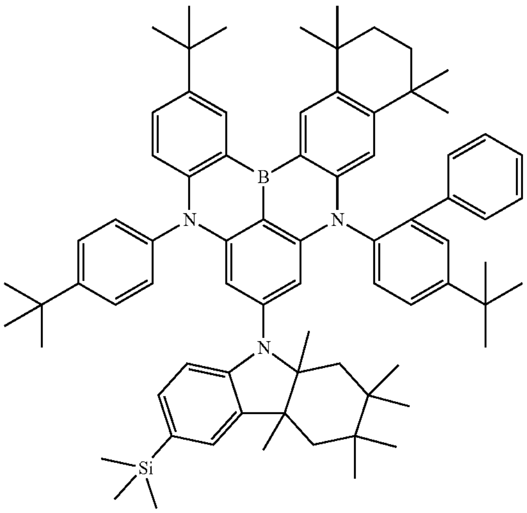
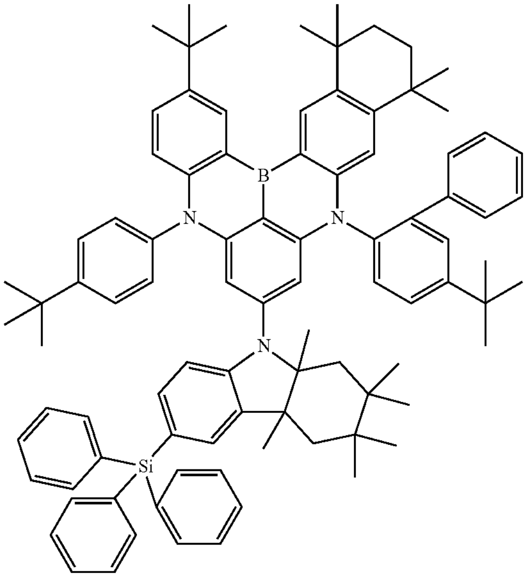
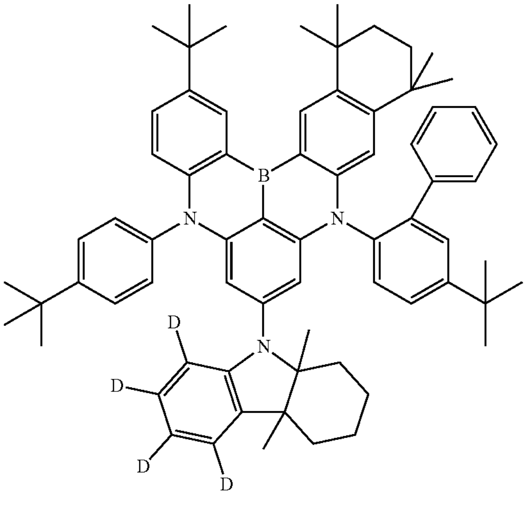
-continued
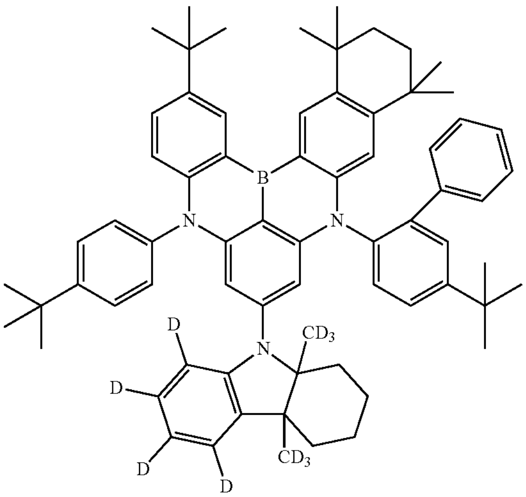
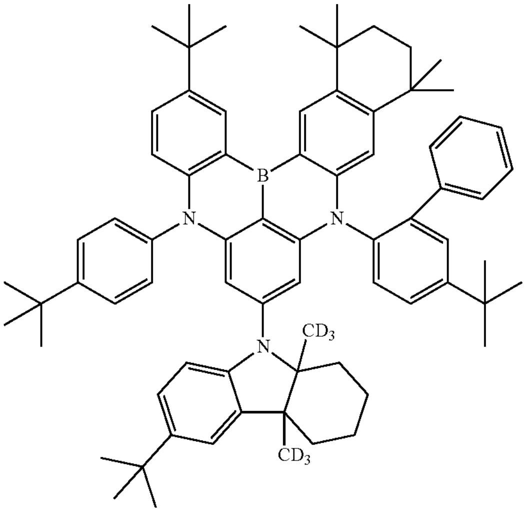
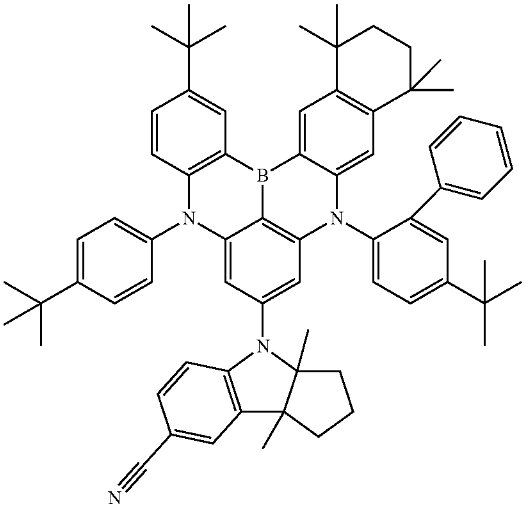

-continued
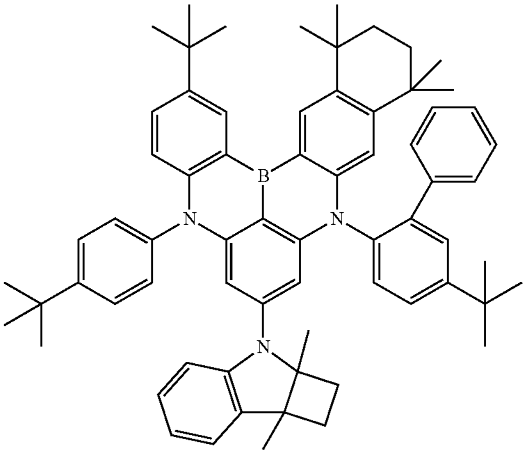
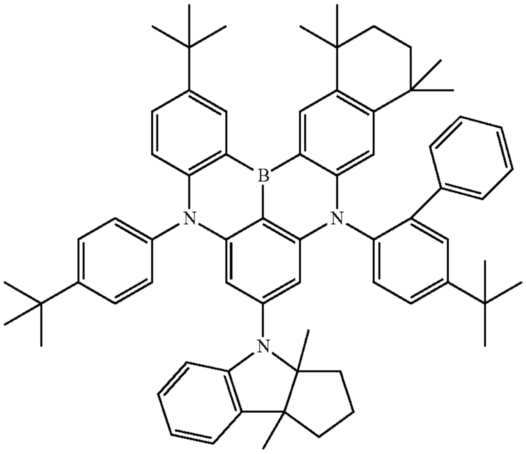
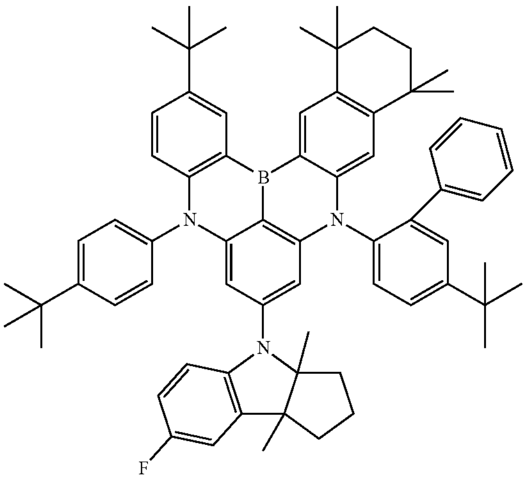
-continued
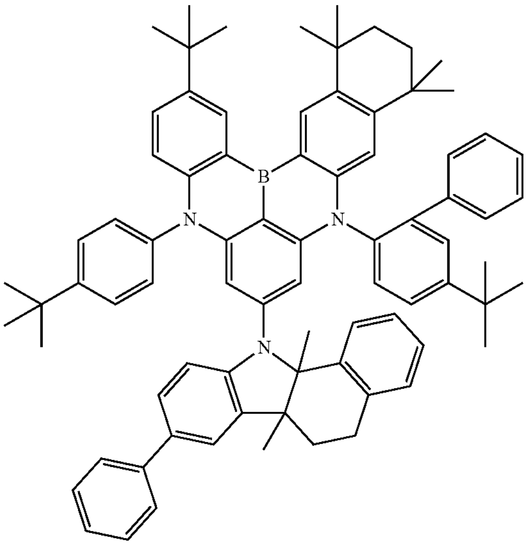
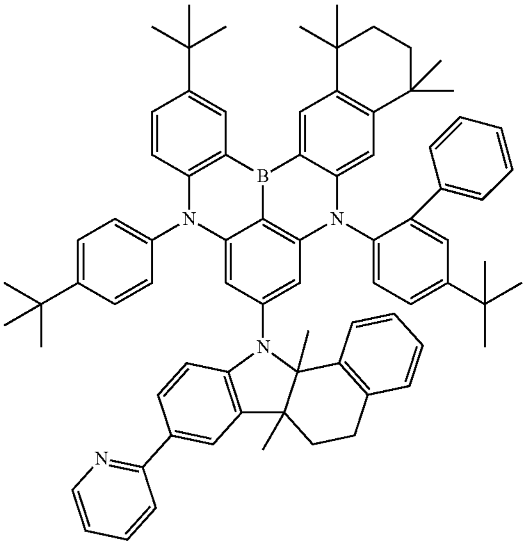
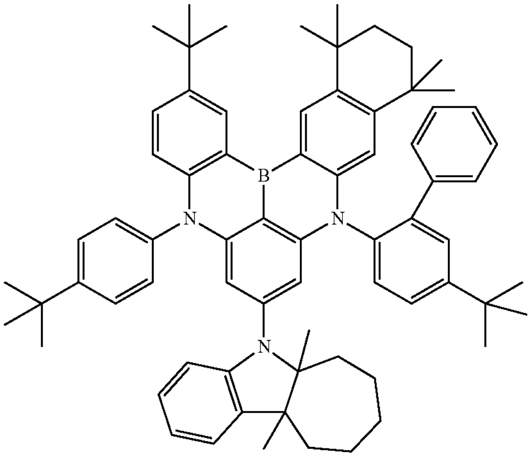

-continued
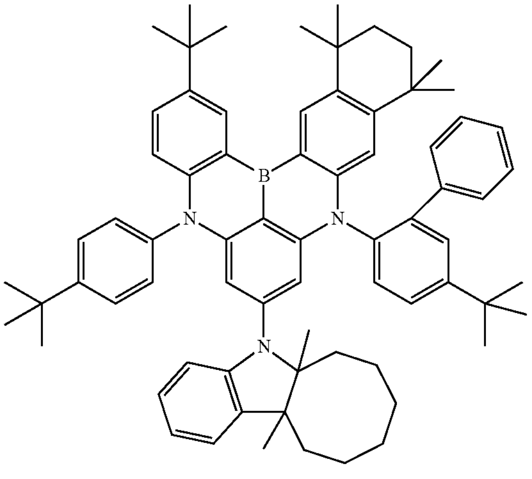
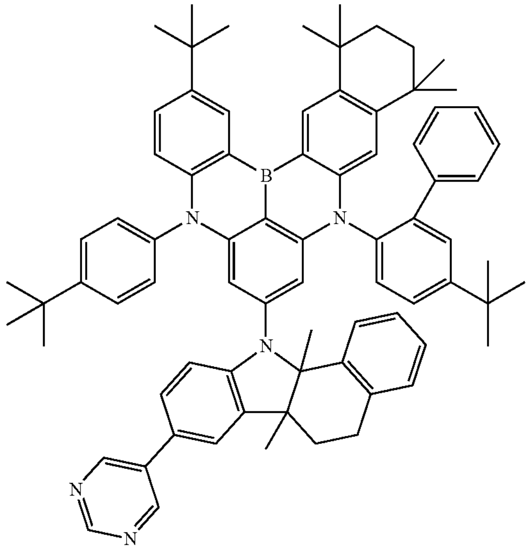
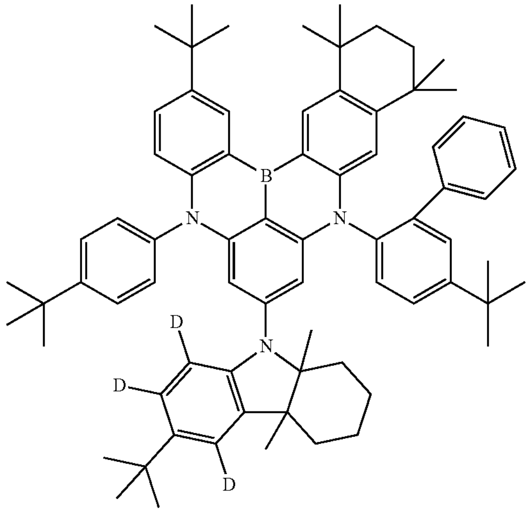
-continued
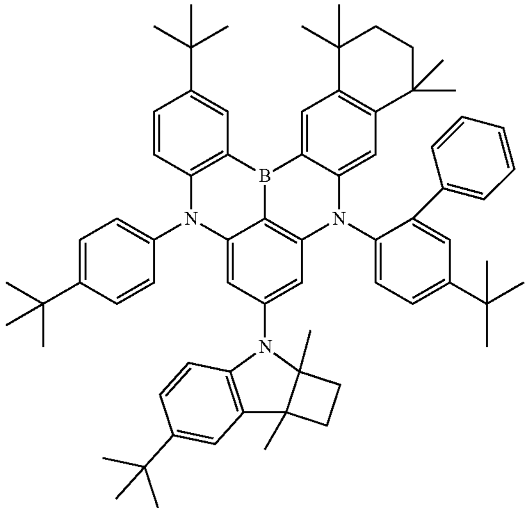
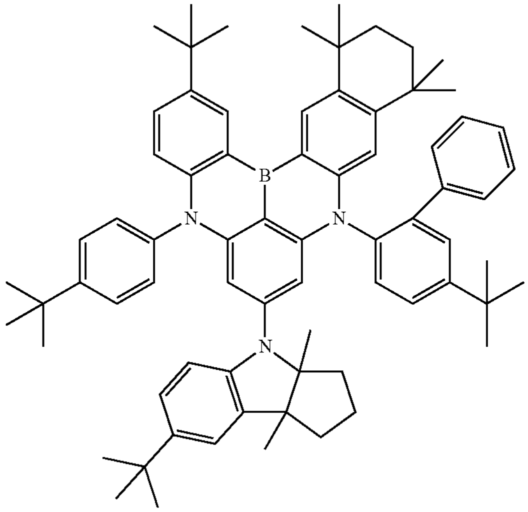
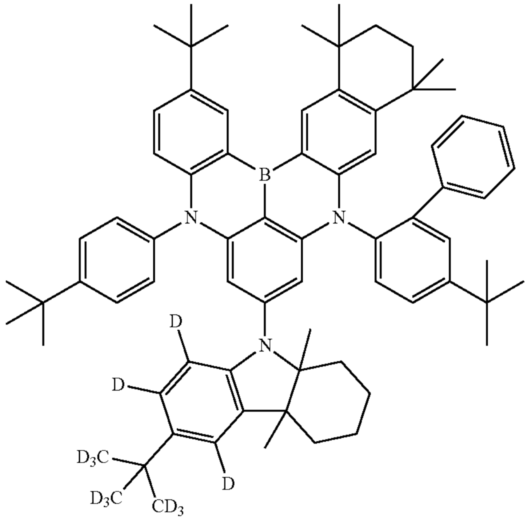

-continued
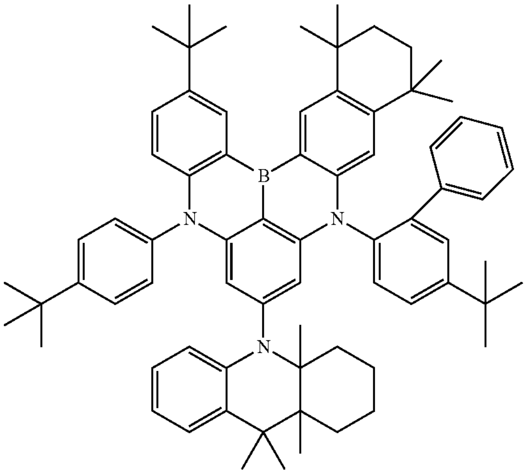
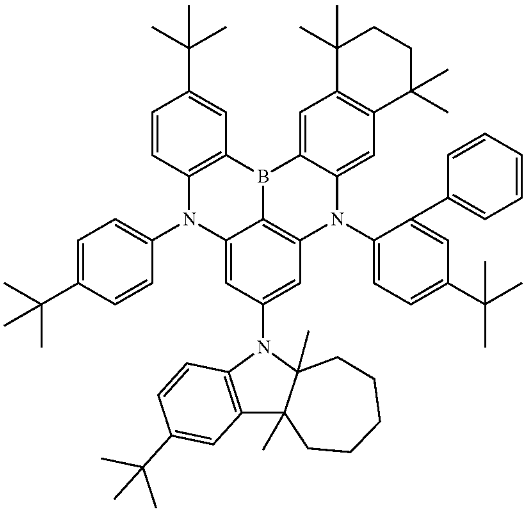
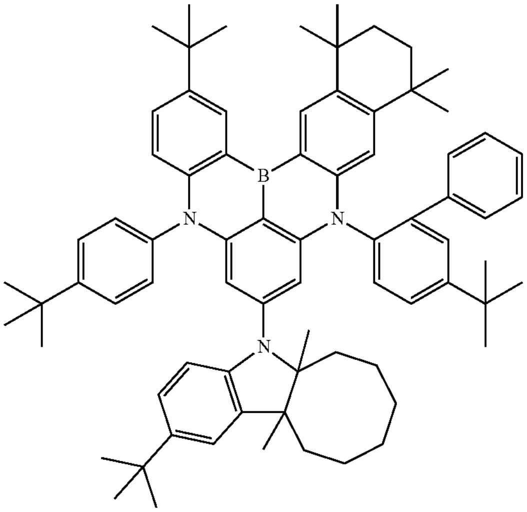
-continued
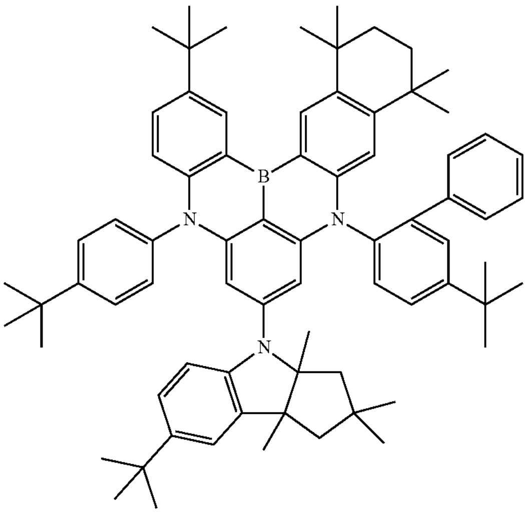
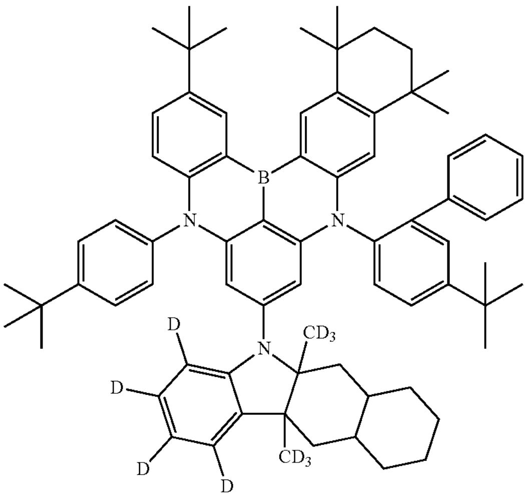
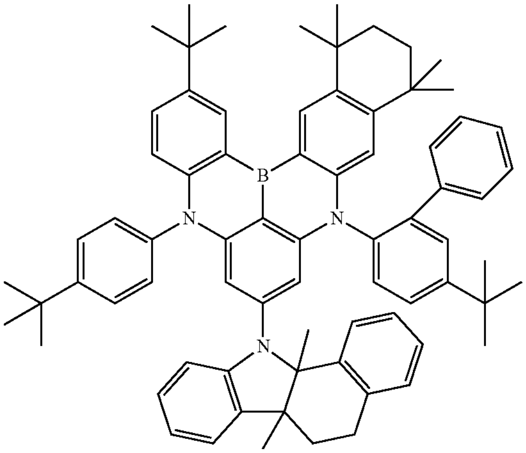

-continued
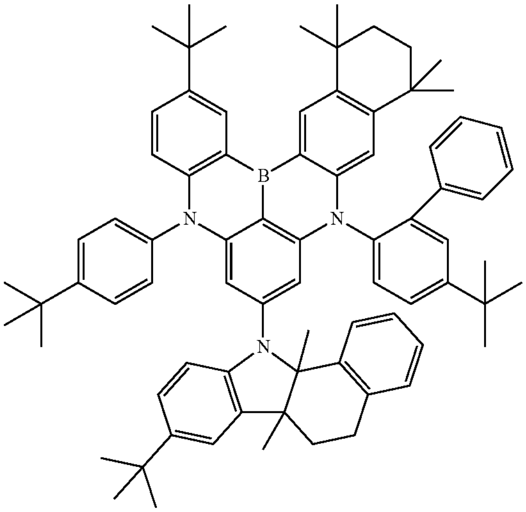
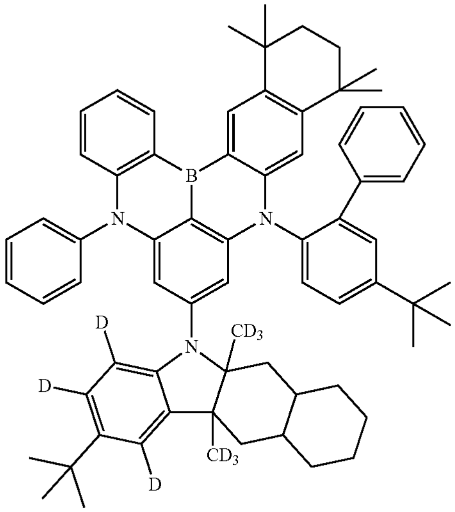
-continued
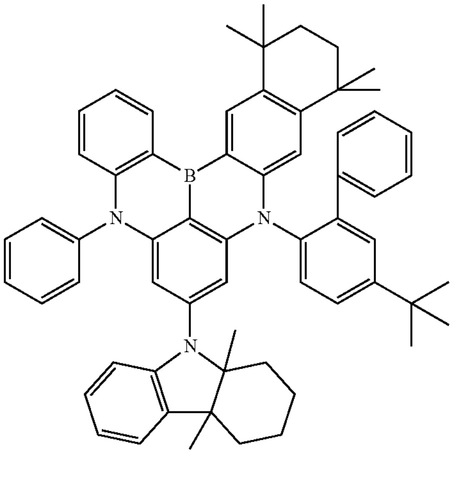
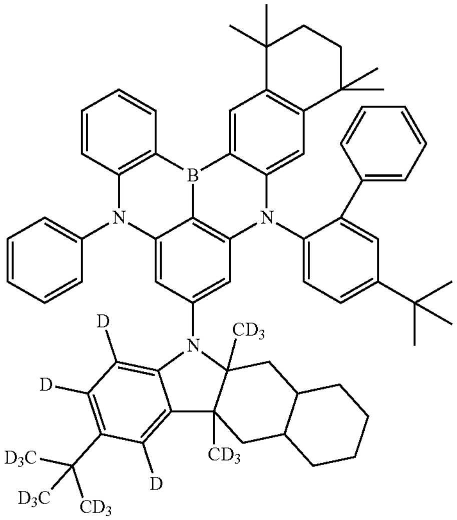
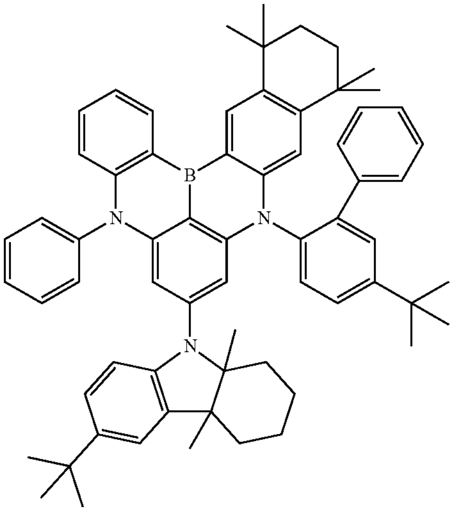
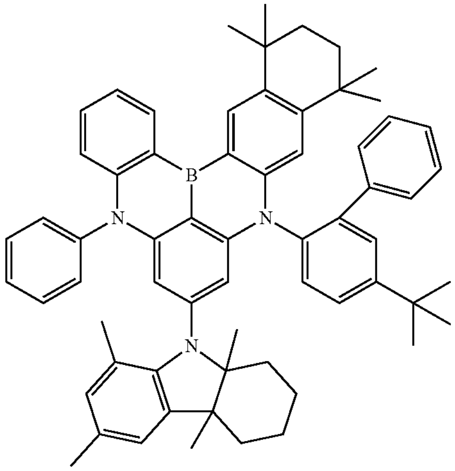

-continued
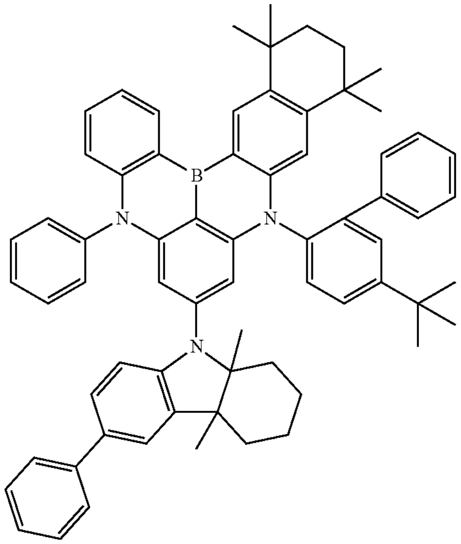
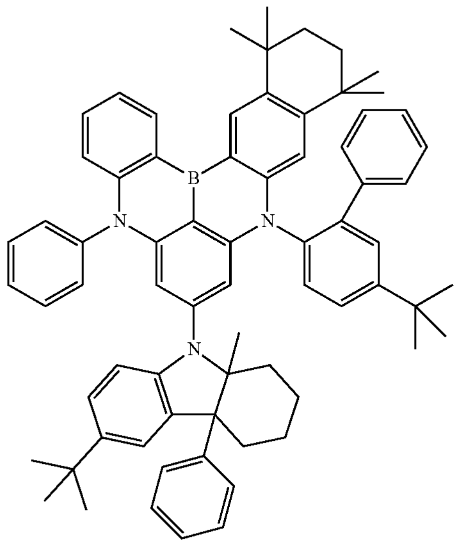
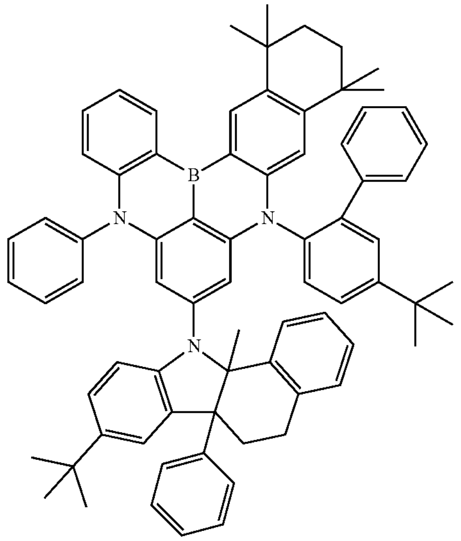
-continued
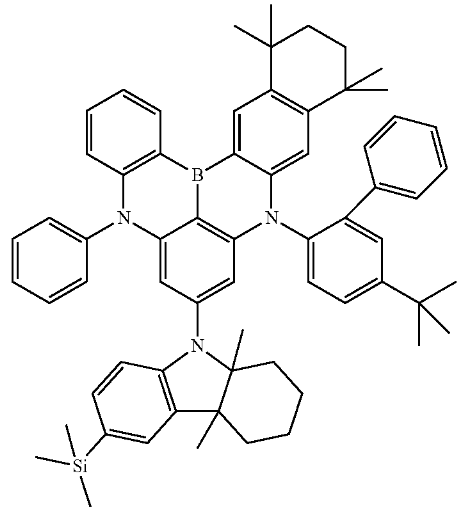
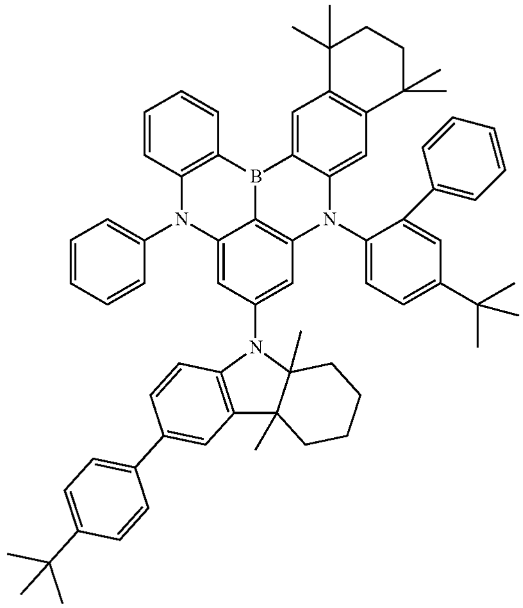
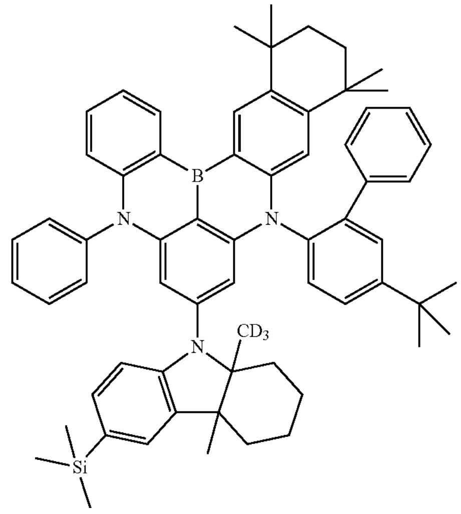

-continued
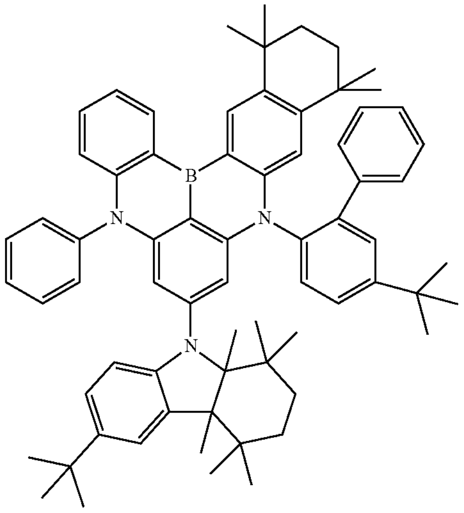
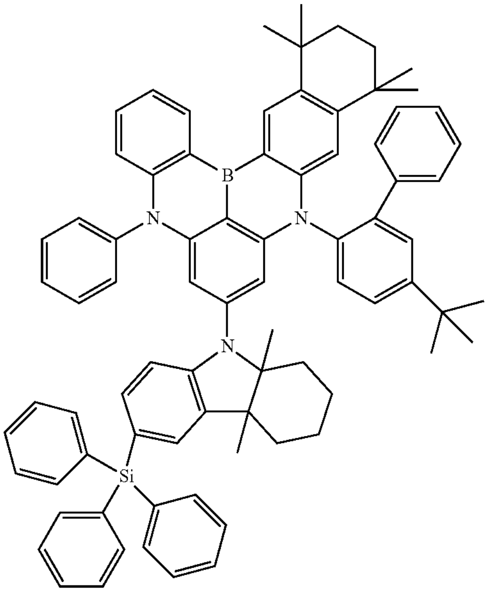
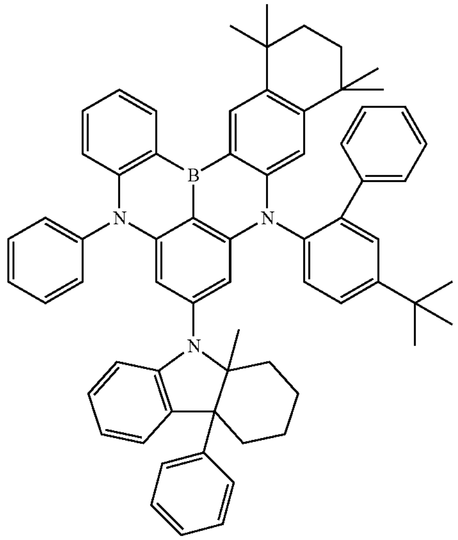
-continued
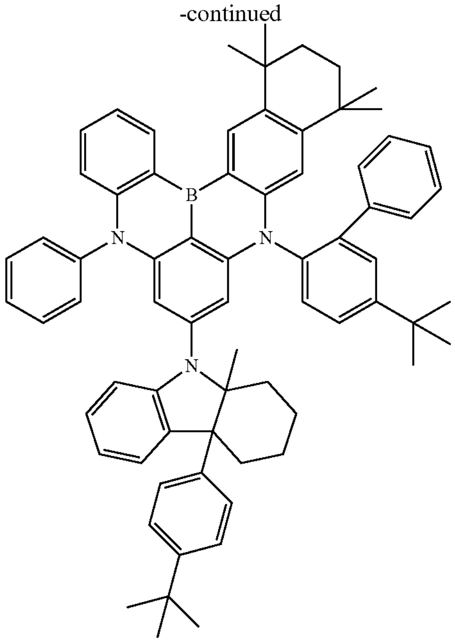
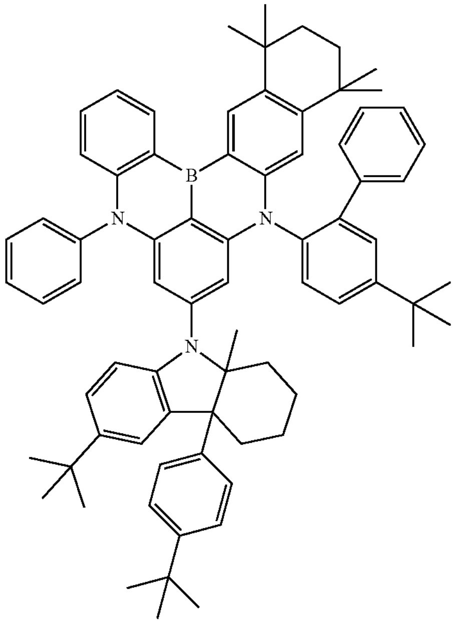

-continued
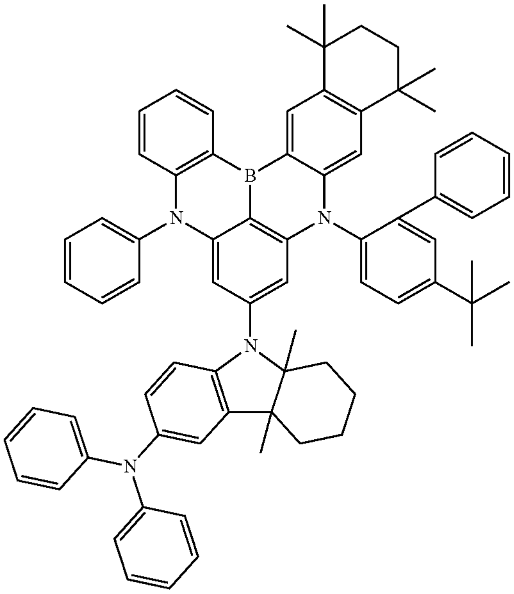
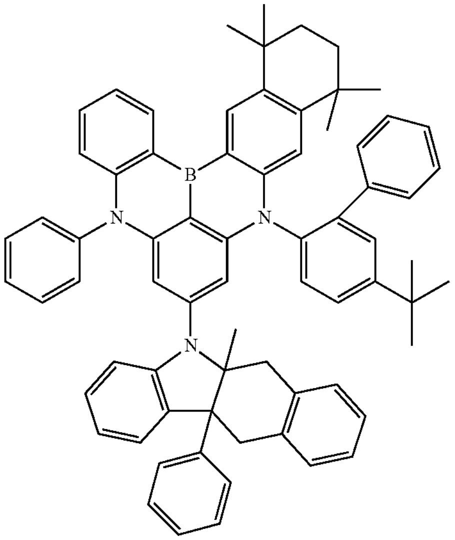
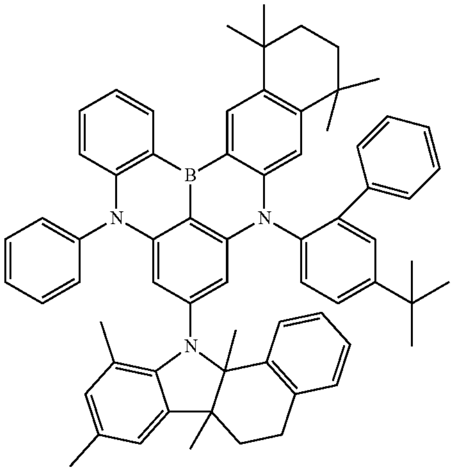
-continued
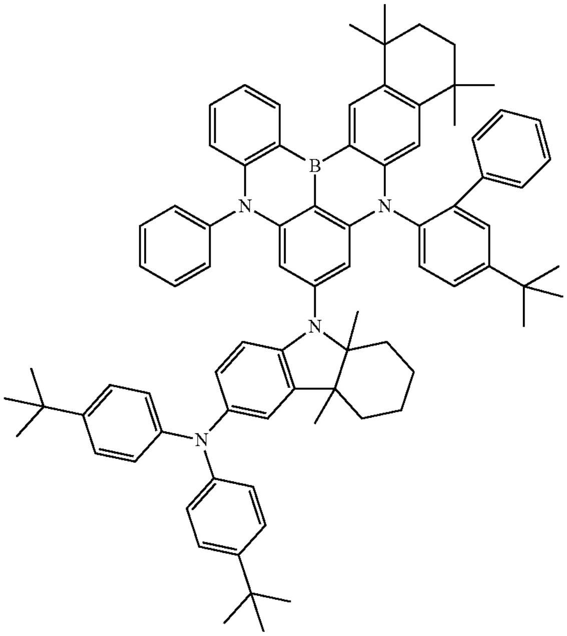
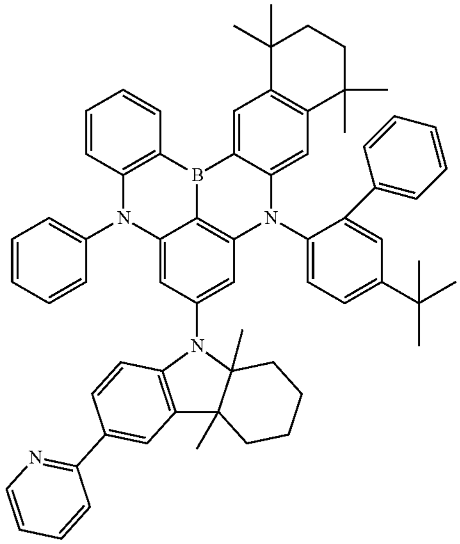
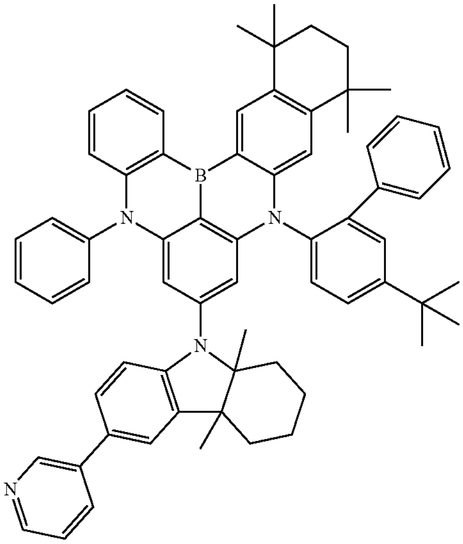

-continued
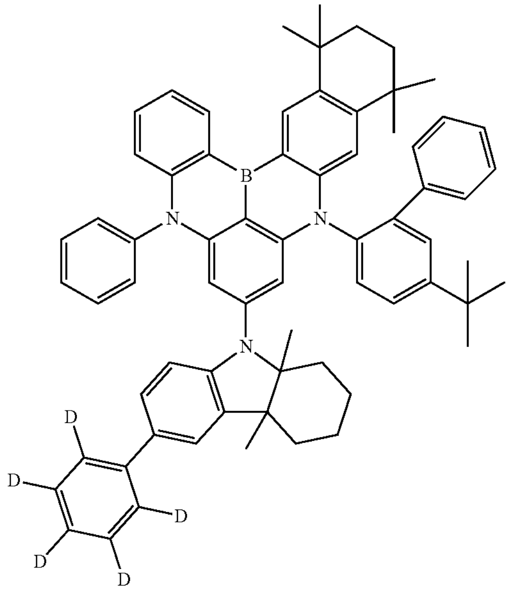
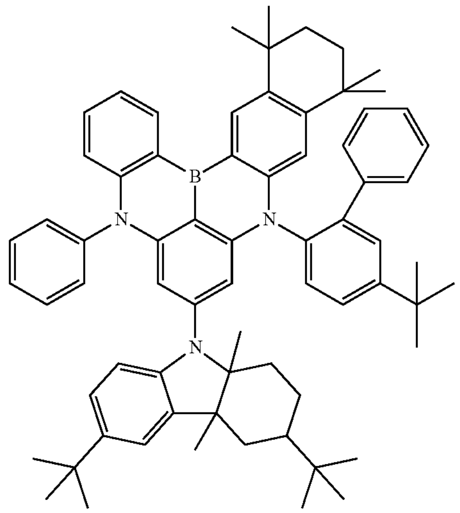
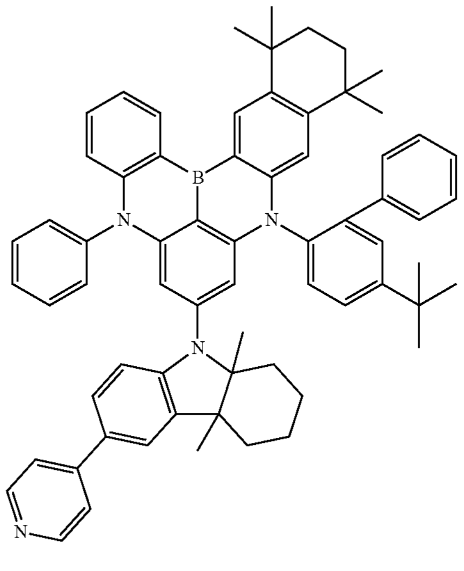
-continued
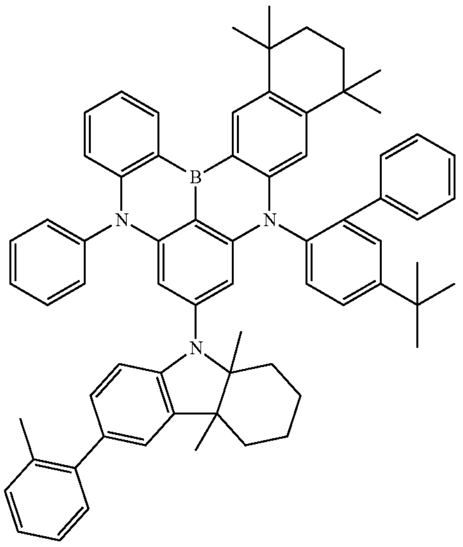
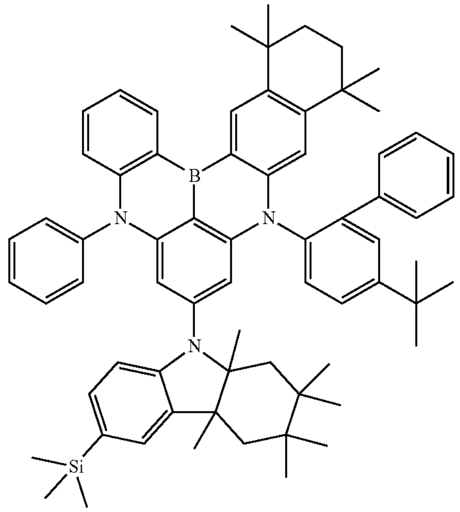
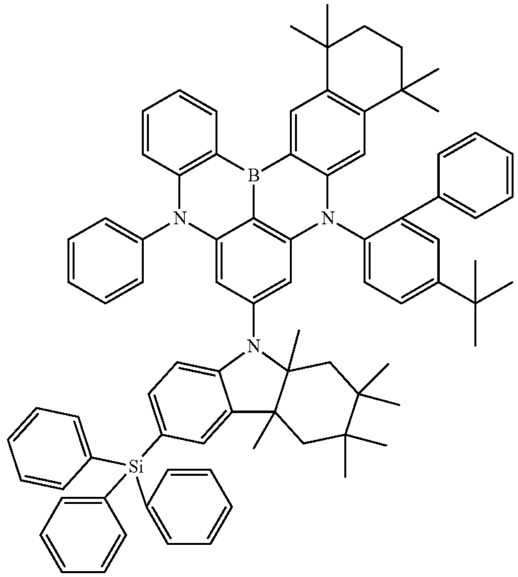

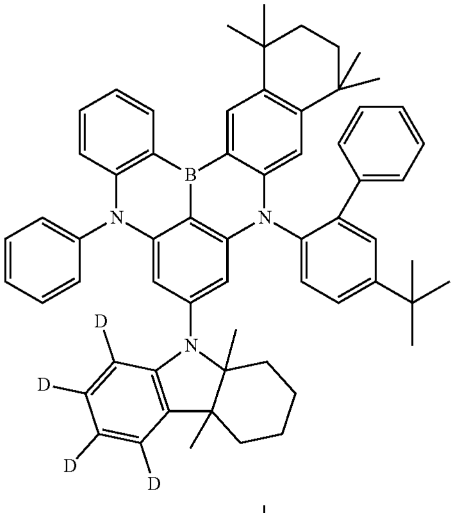
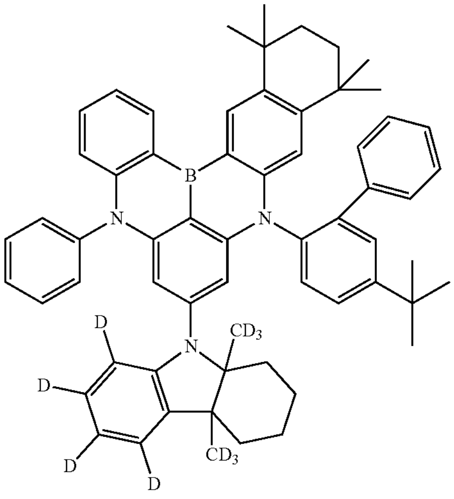
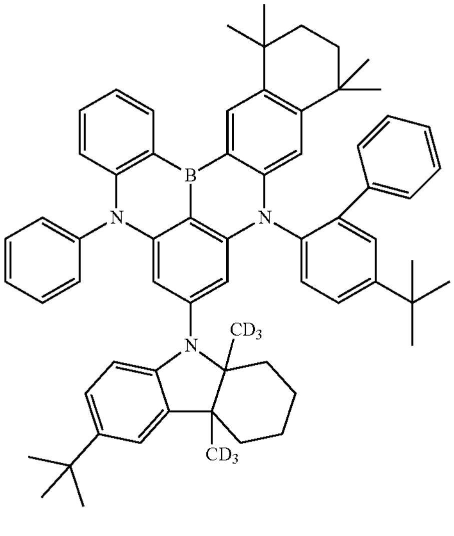
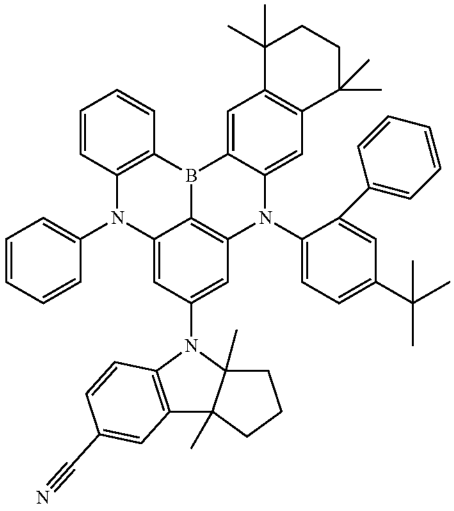
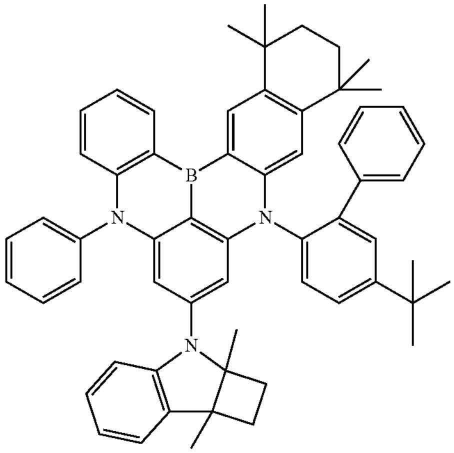
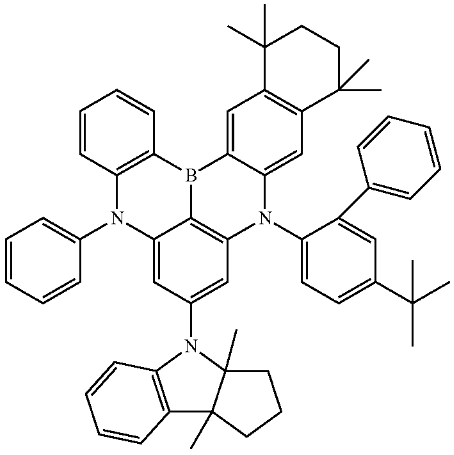

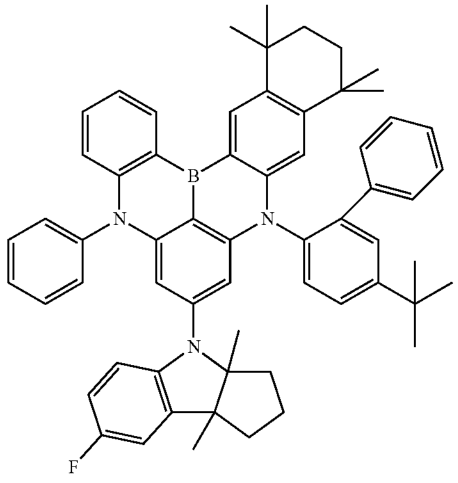
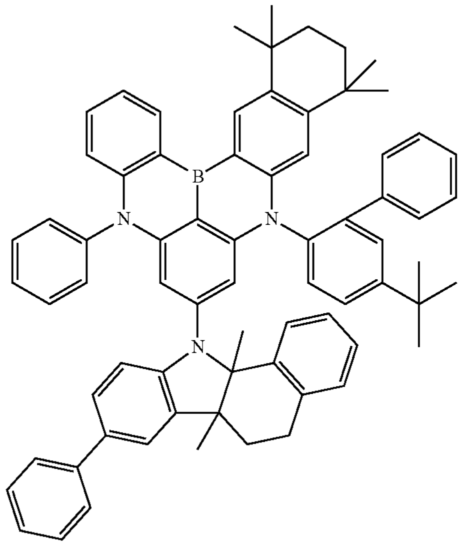
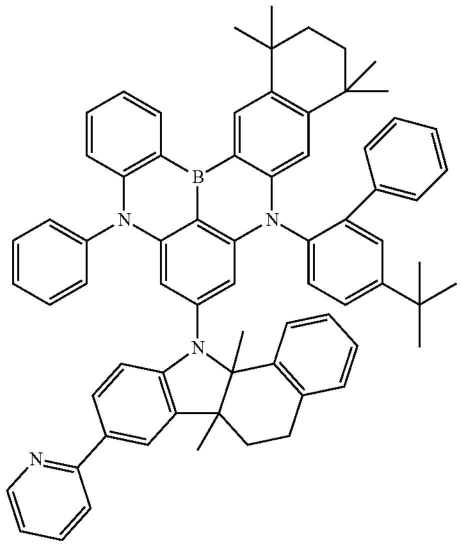
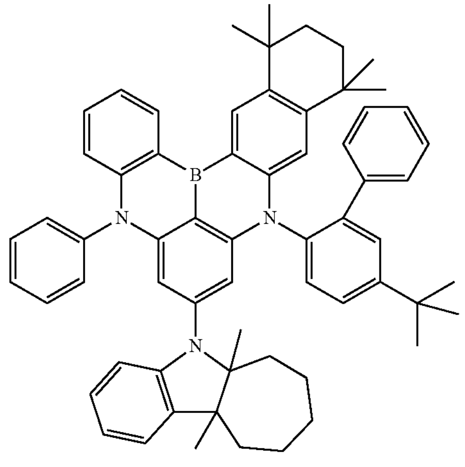
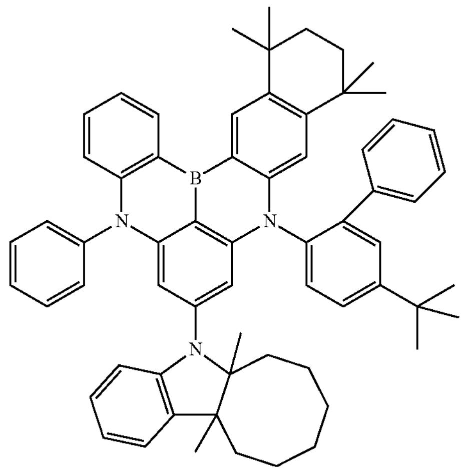
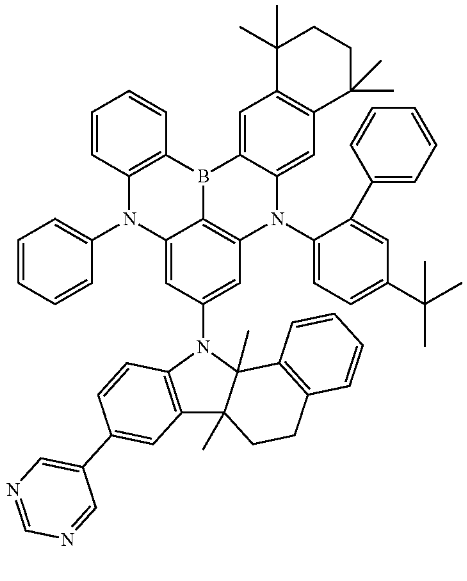

-continued
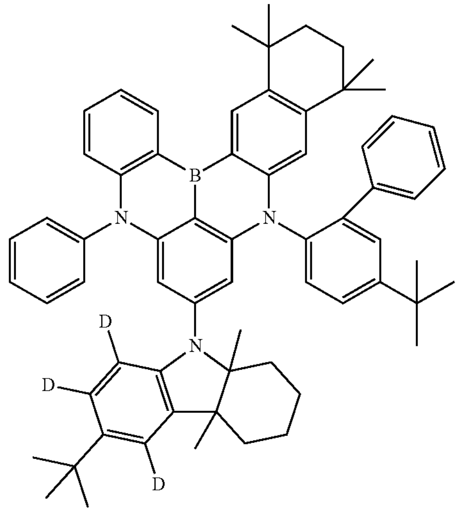
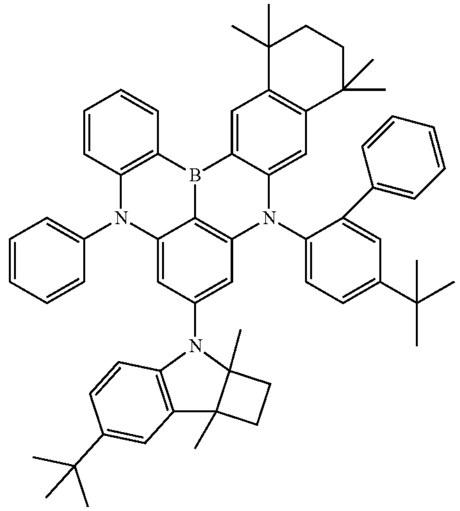
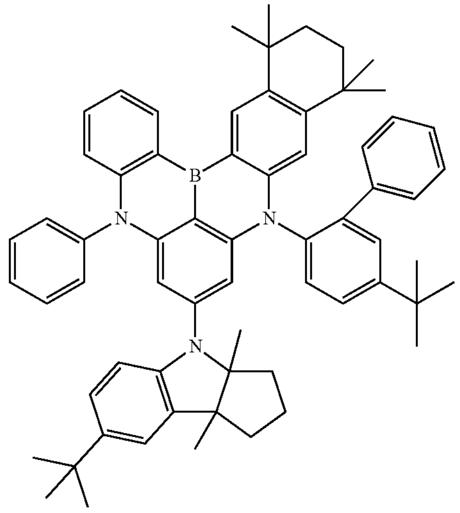
-continued
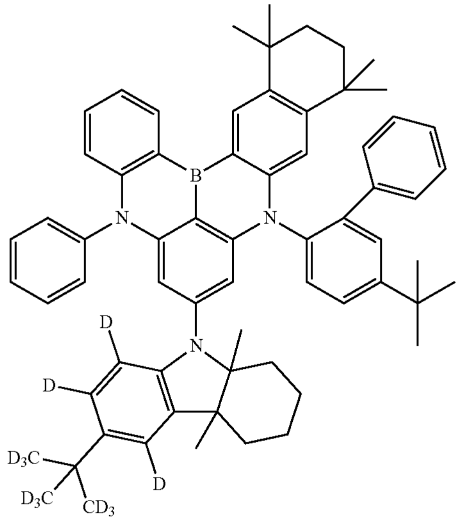
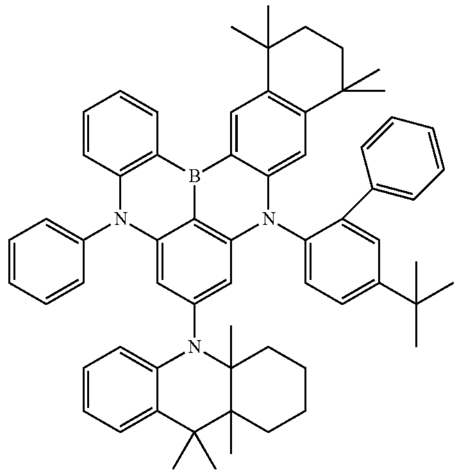
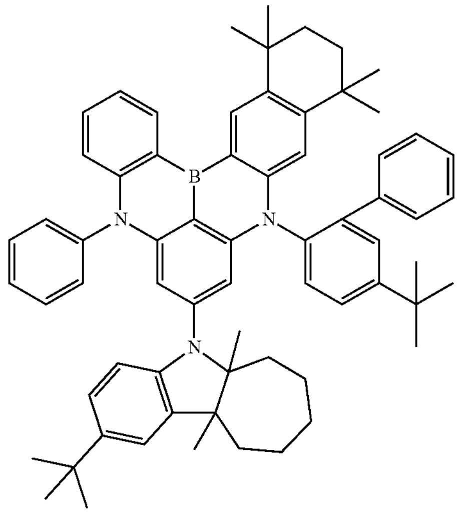

-continued
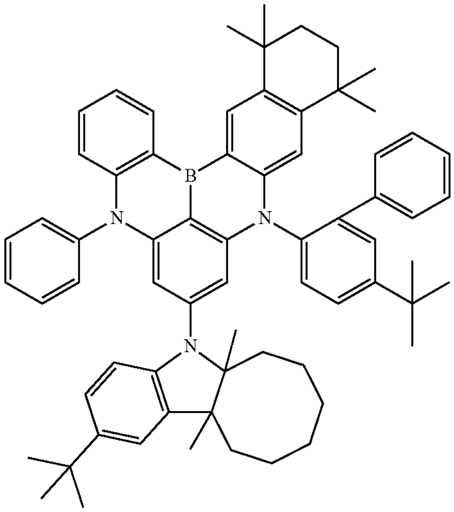
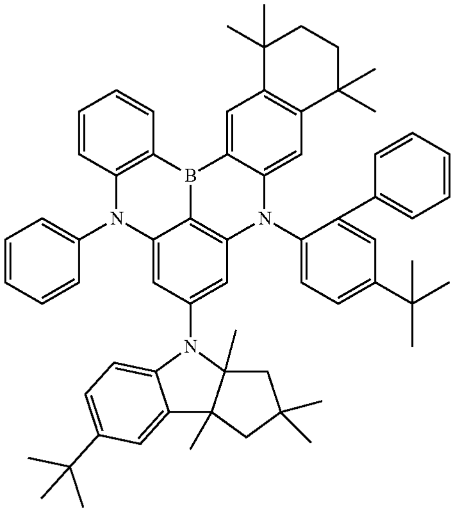
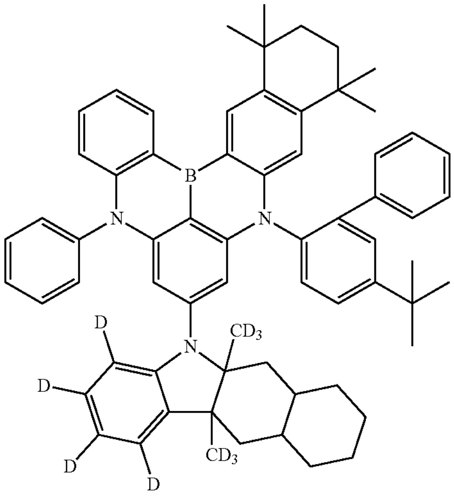
-continued
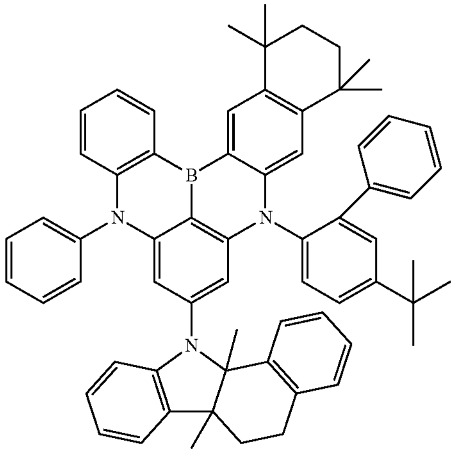
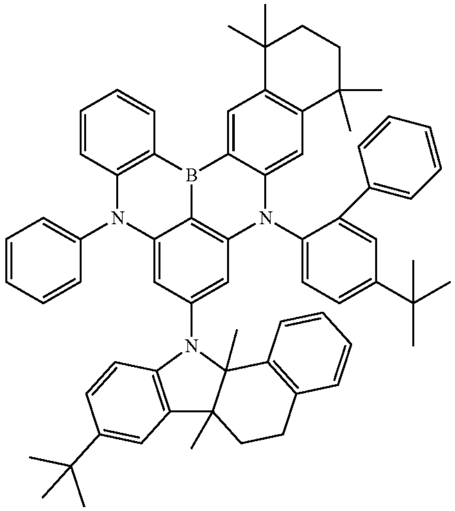
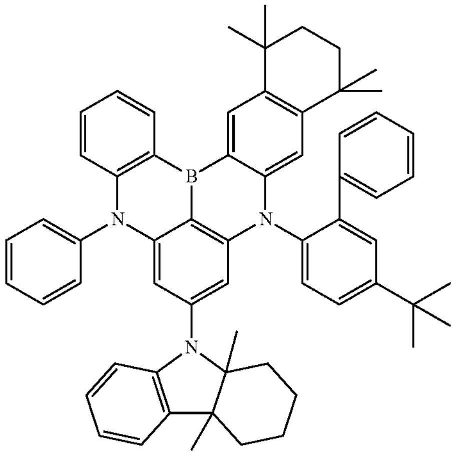

-continued
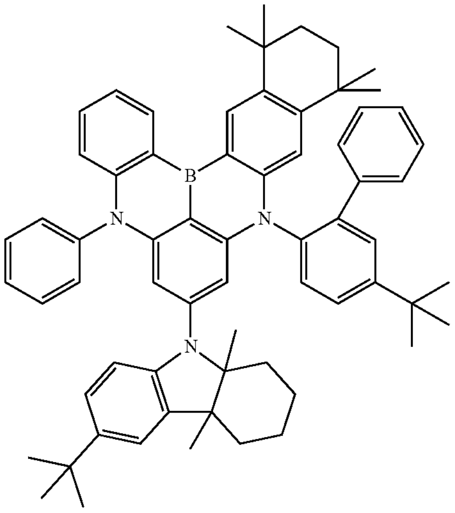
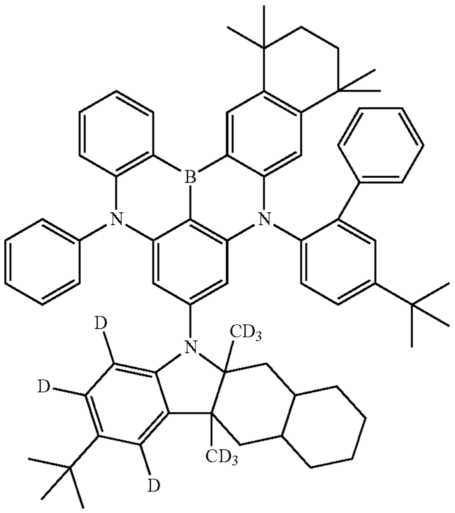
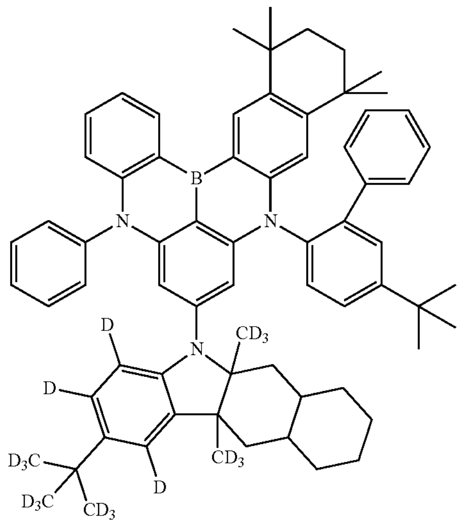
-continued
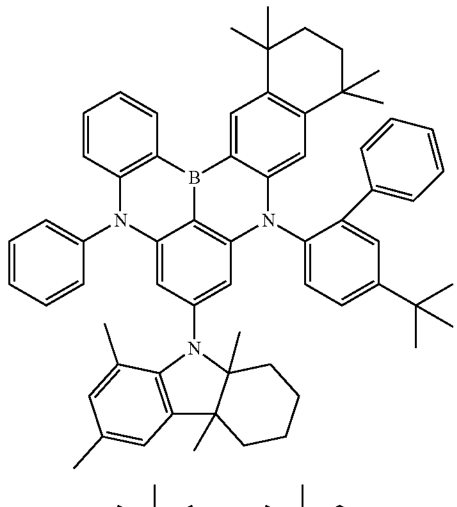
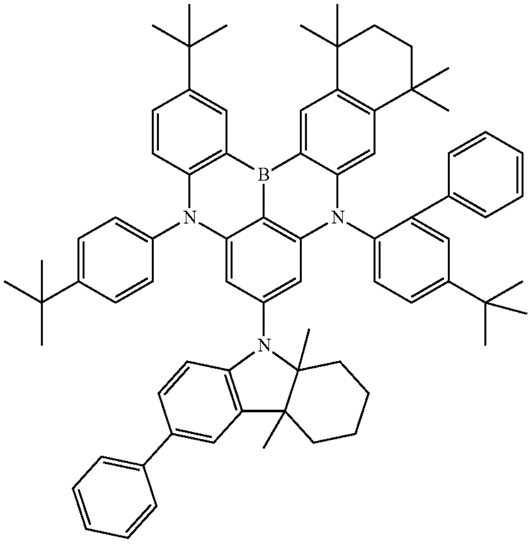
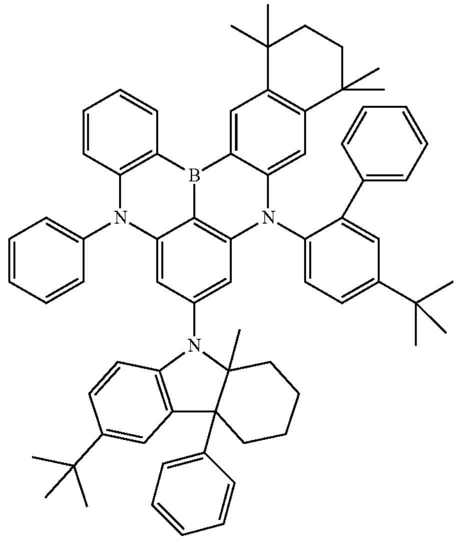

-continued
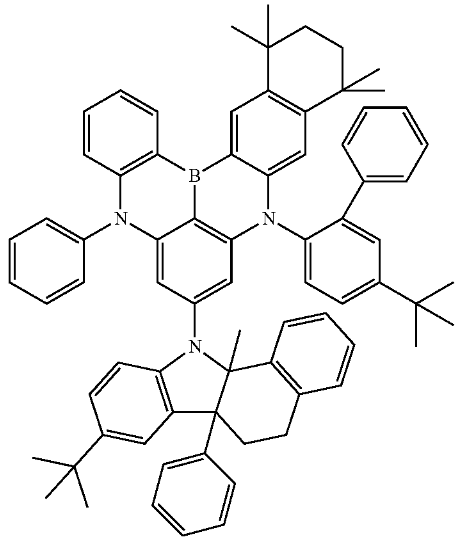
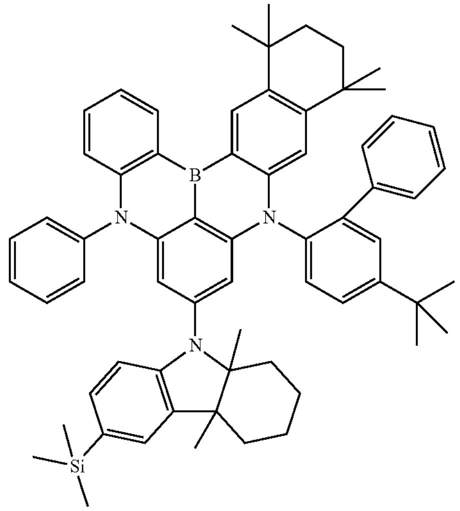
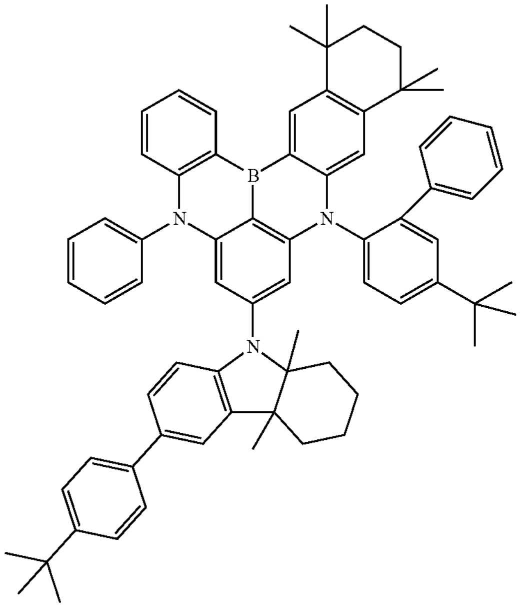
-continued
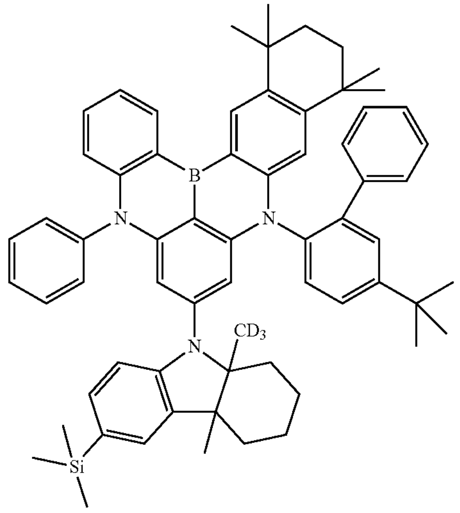
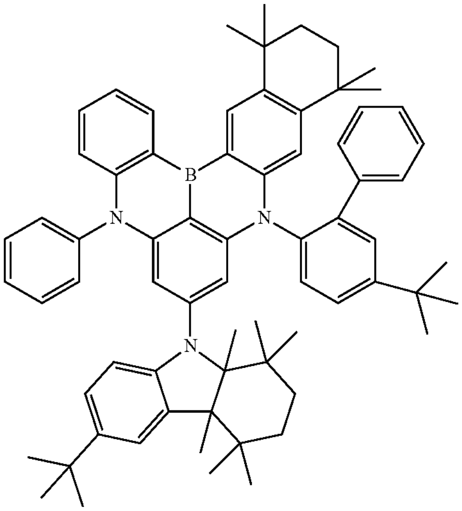
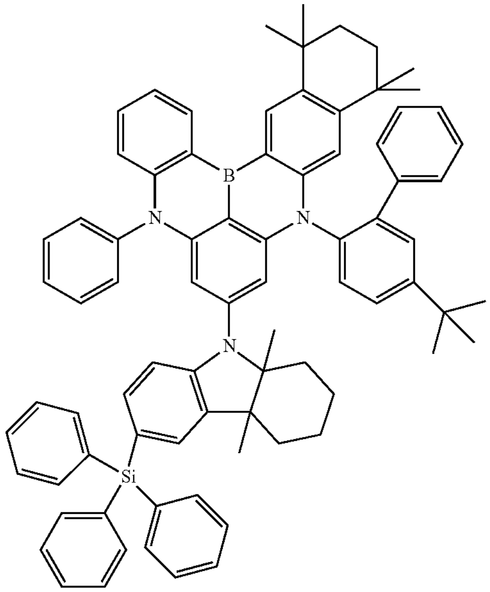

-continued
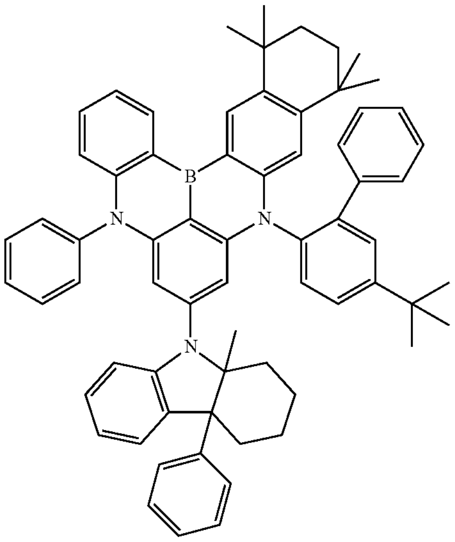
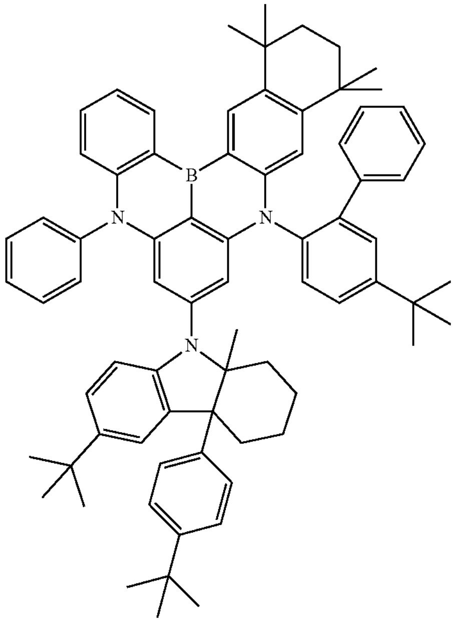
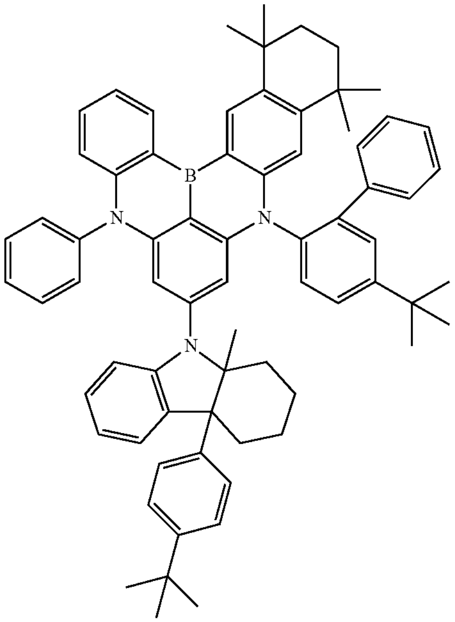
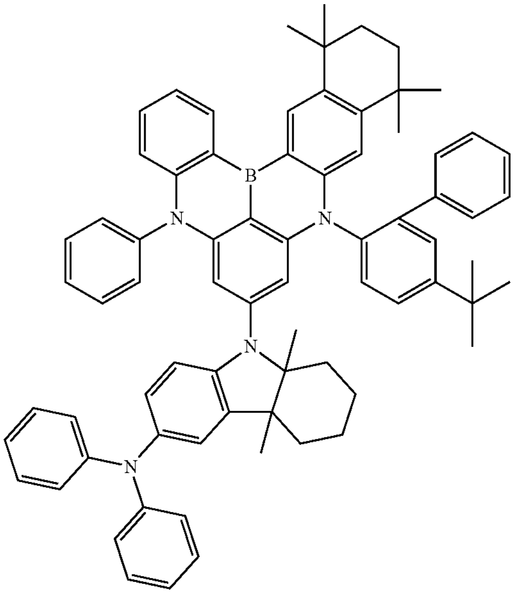
-continued

-continued
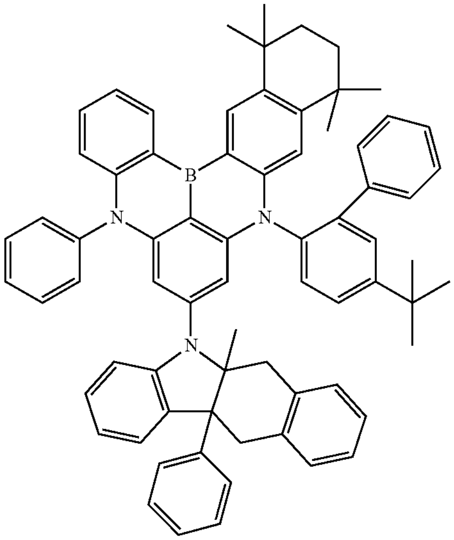
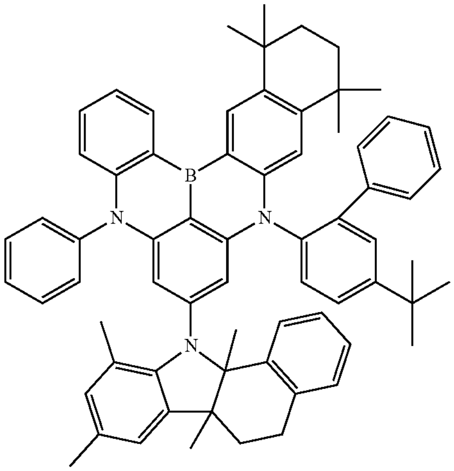
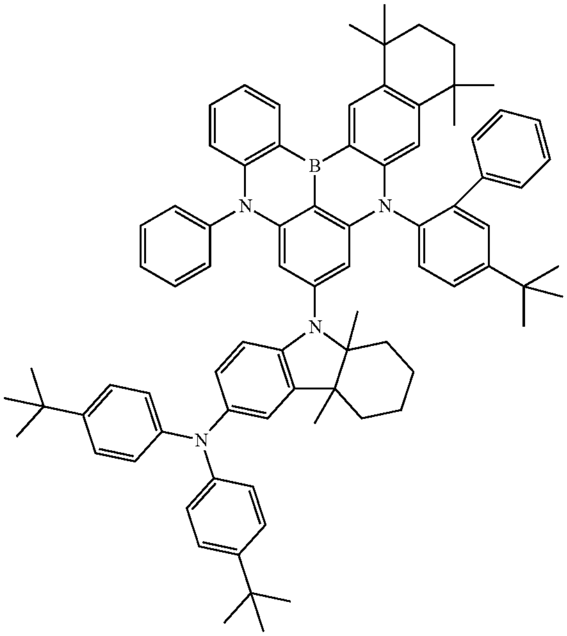
-continued
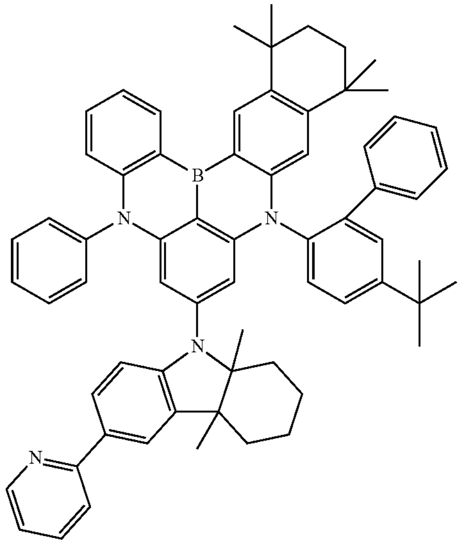
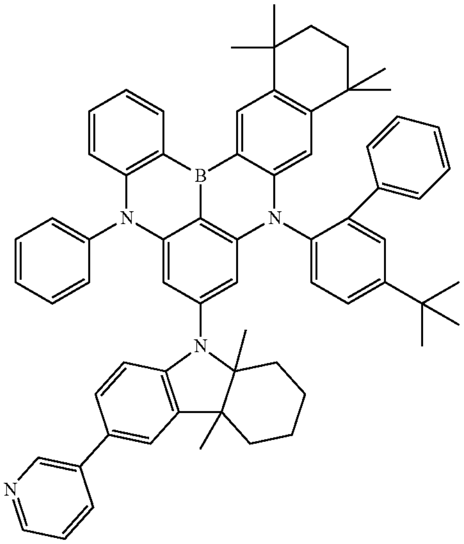
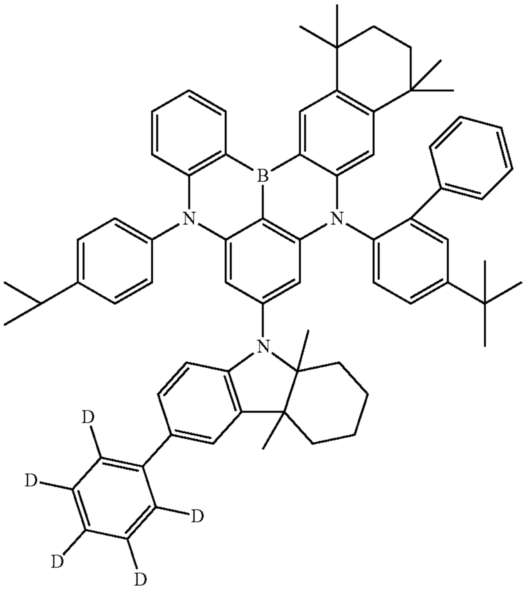

-continued
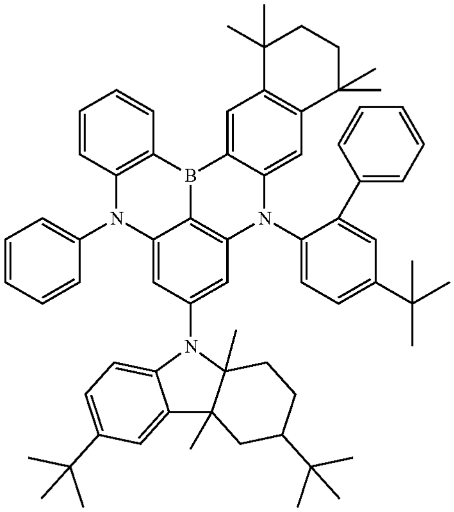
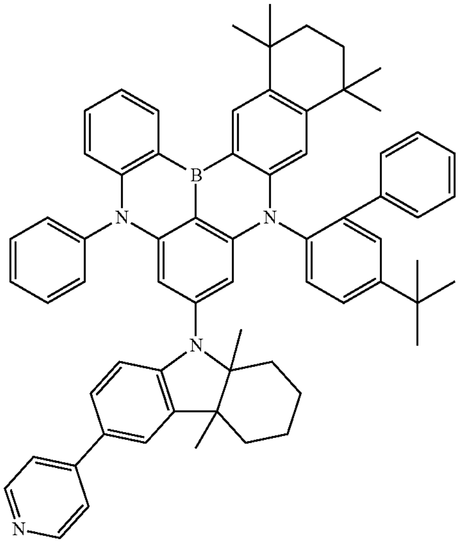
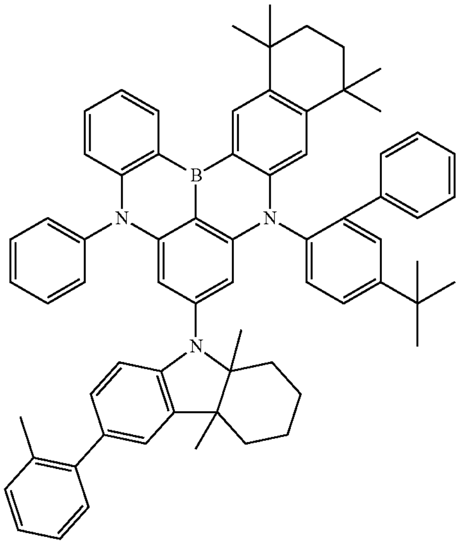
-continued
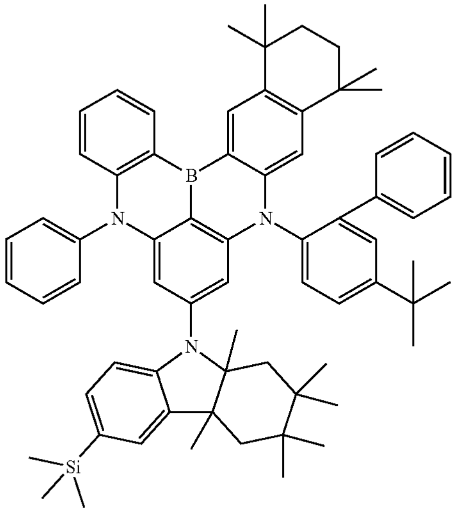
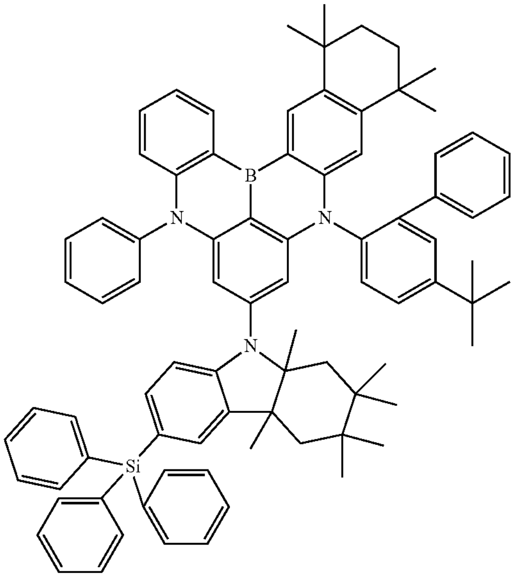
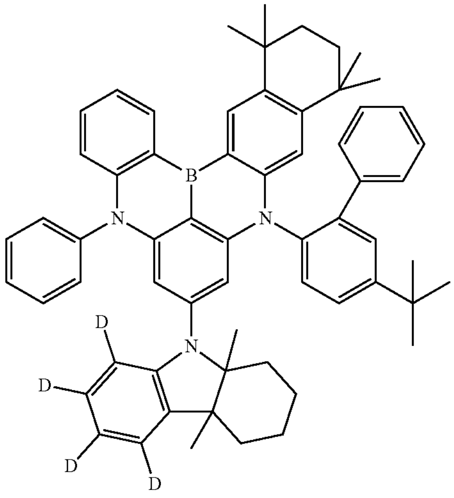

-continued
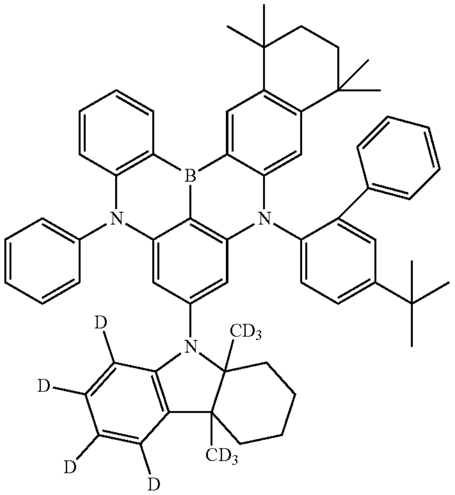
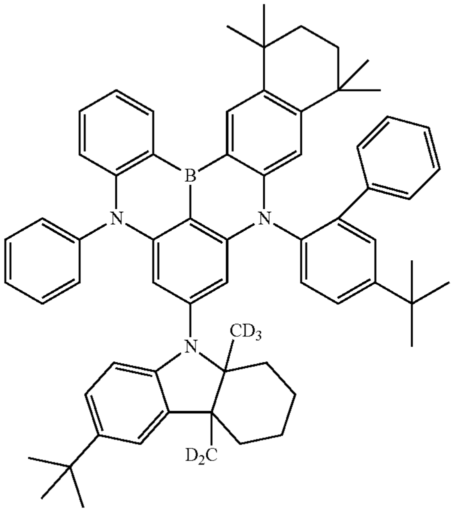
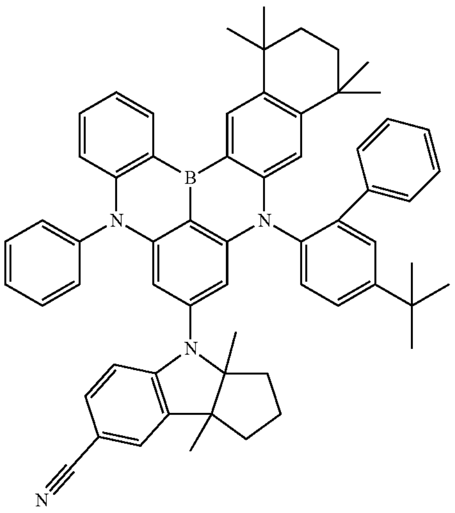
-continued
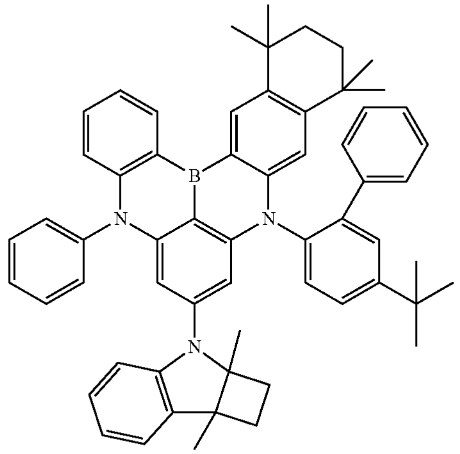
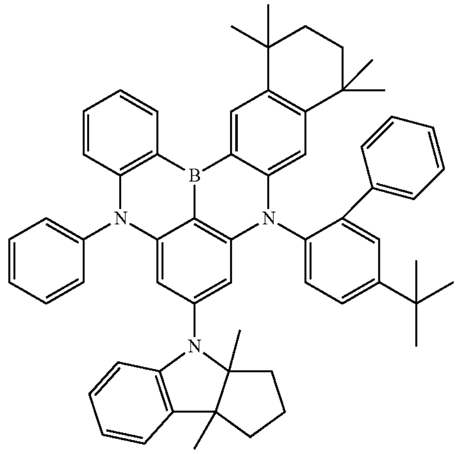
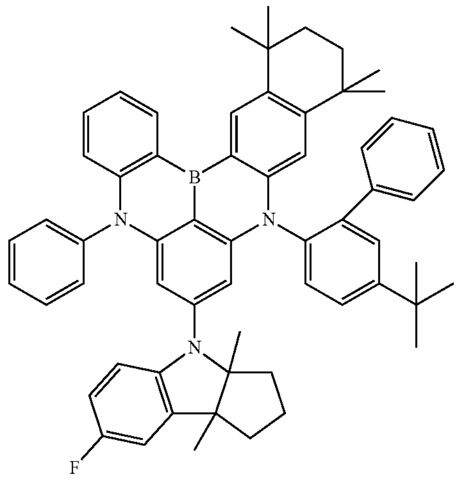

-continued
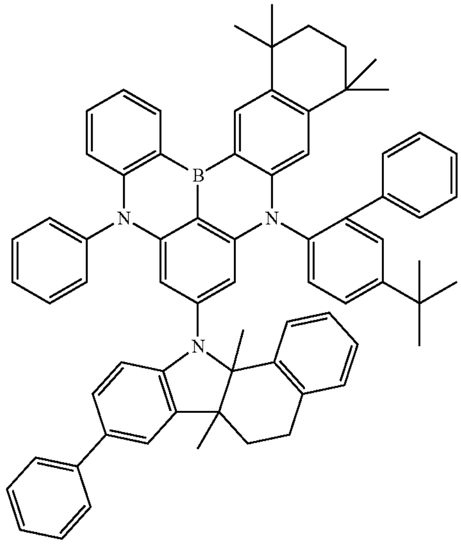
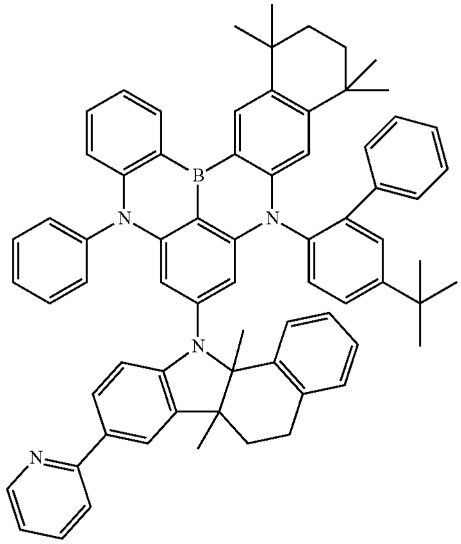
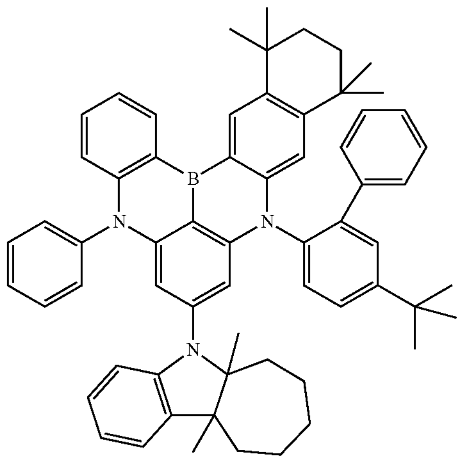
-continued
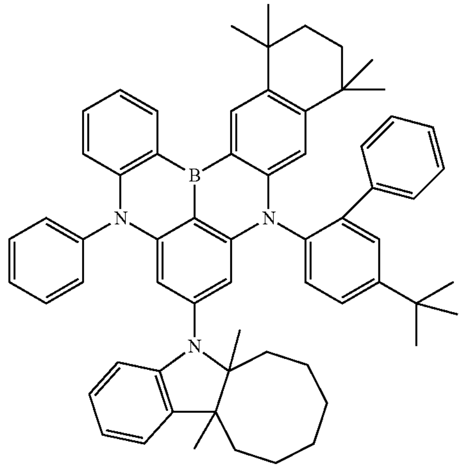
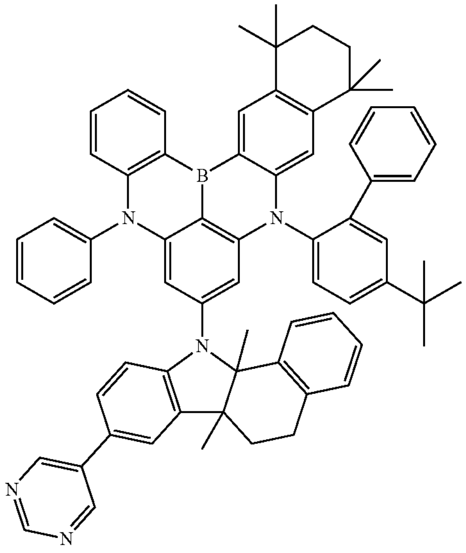
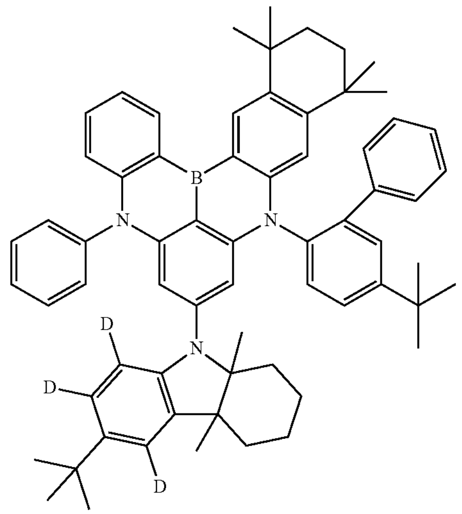

-continued
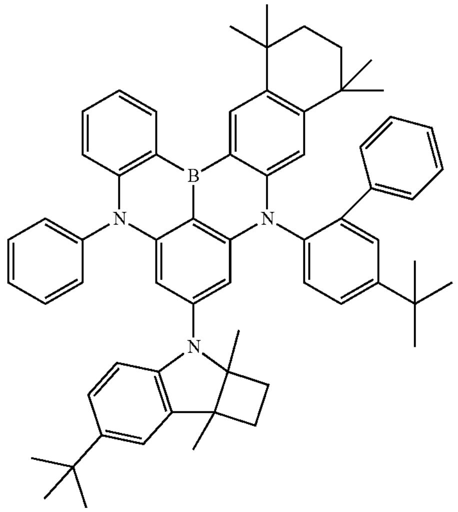
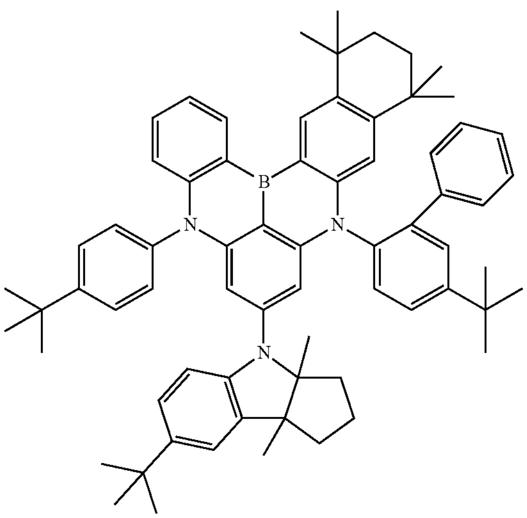
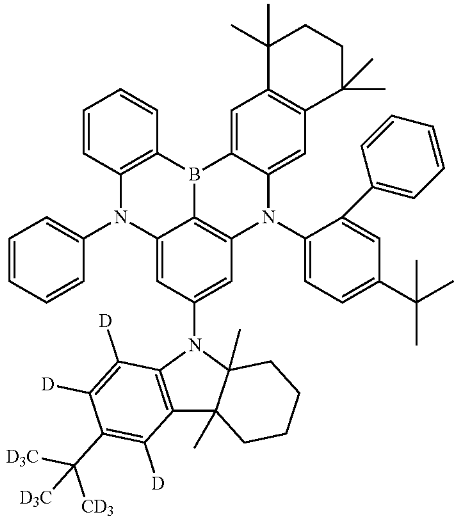
-continued
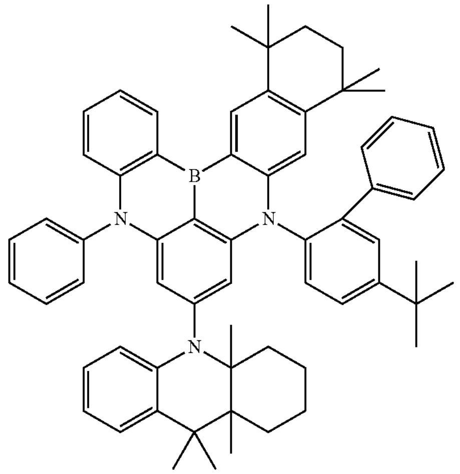
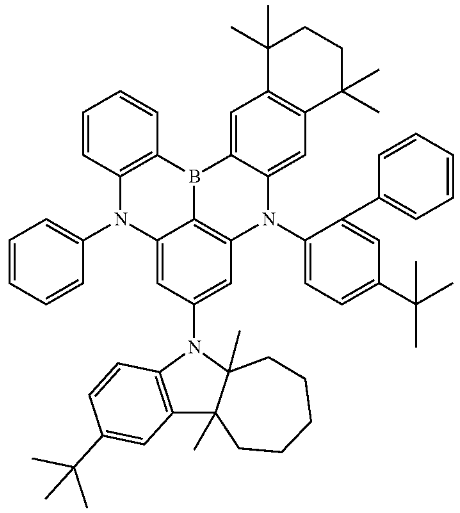
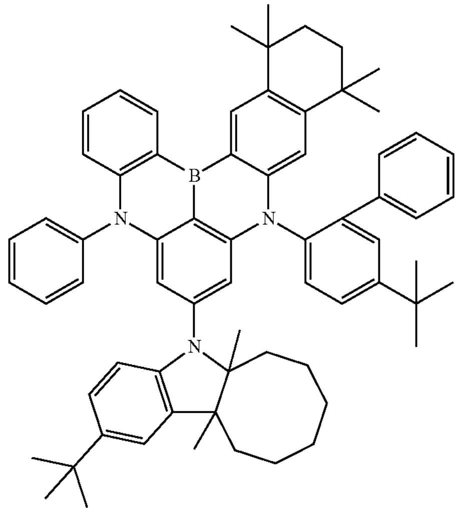

-continued
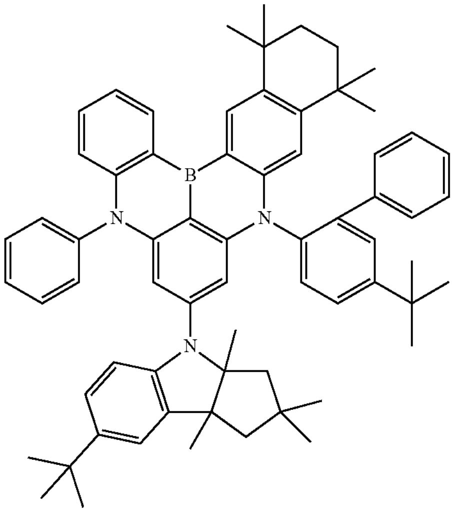
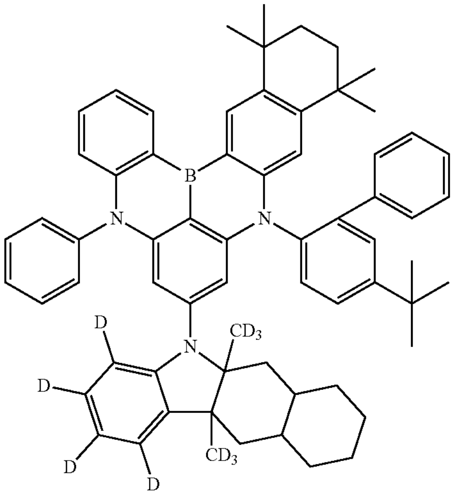
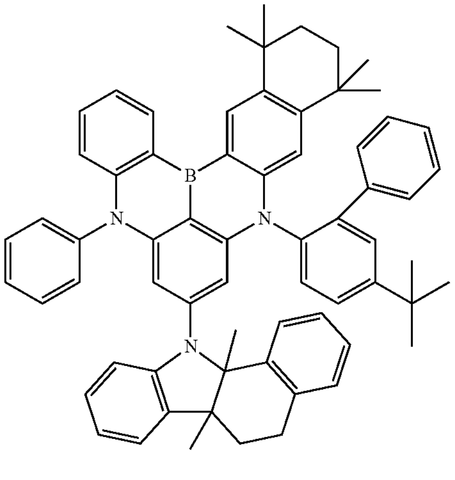
-continued
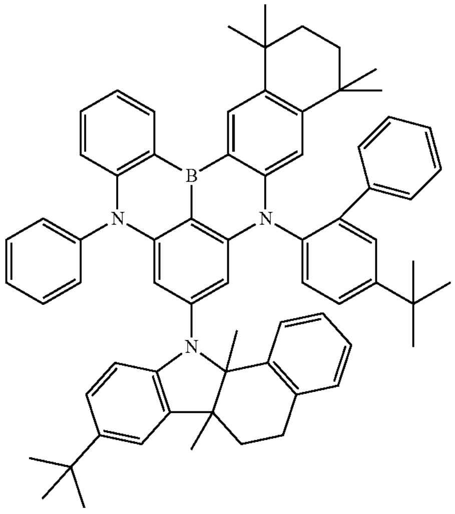
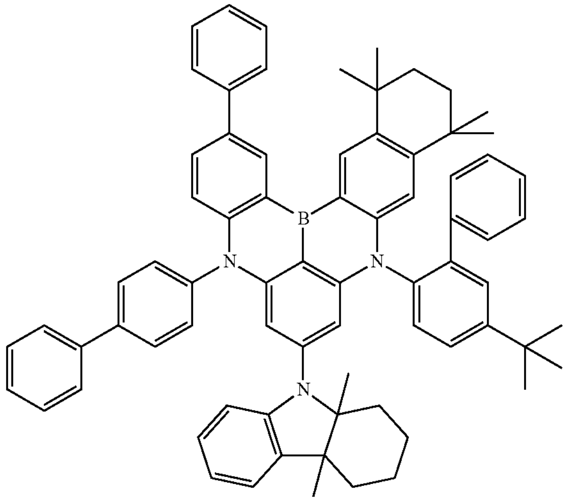
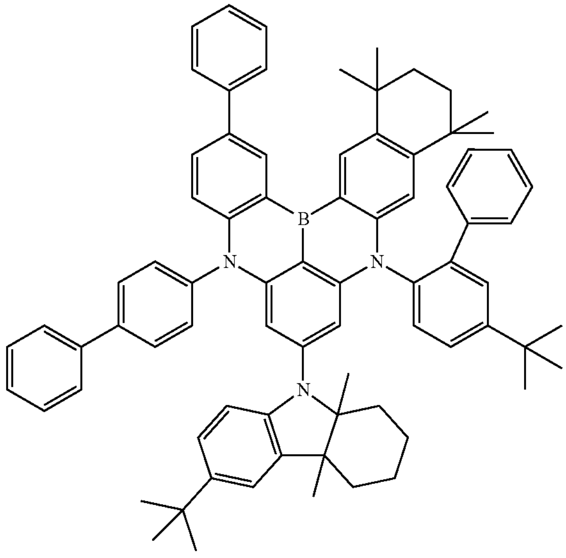

-continued
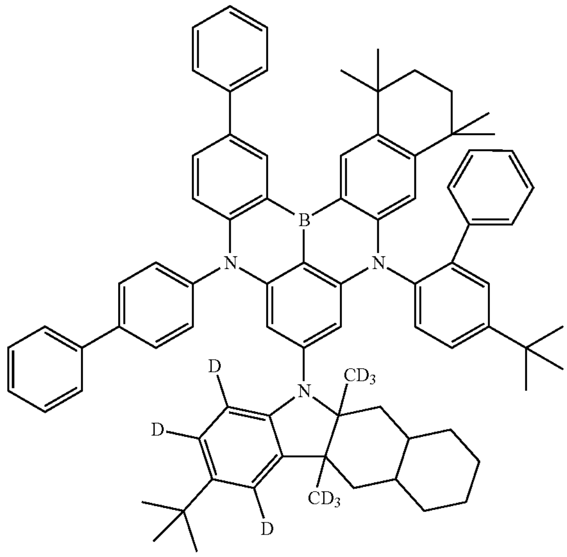
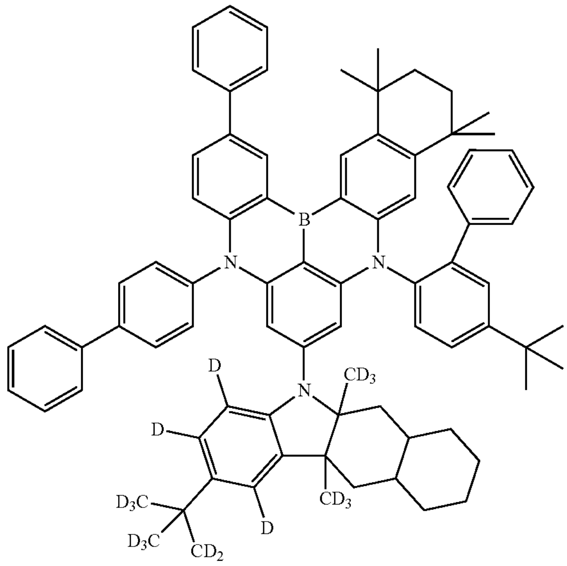
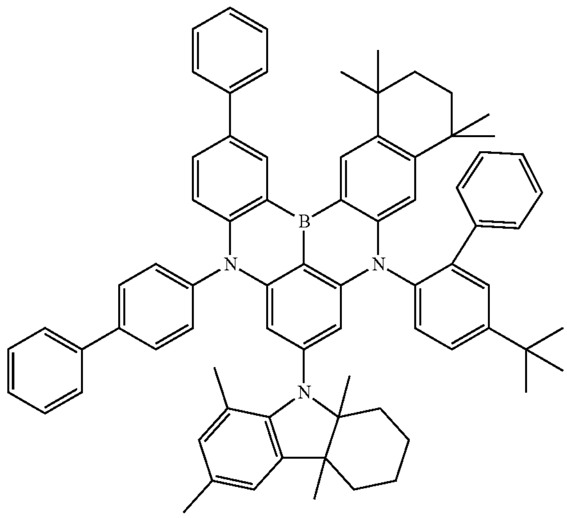
-continued
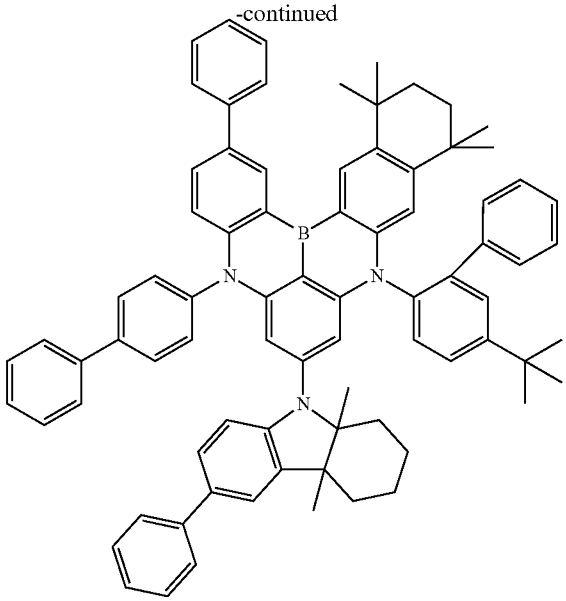
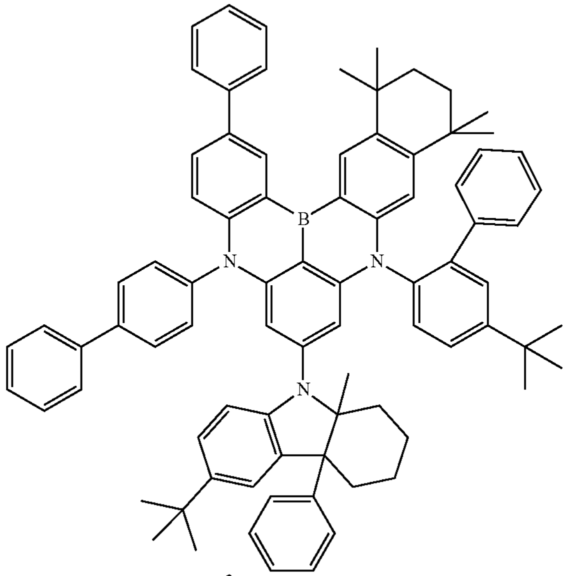
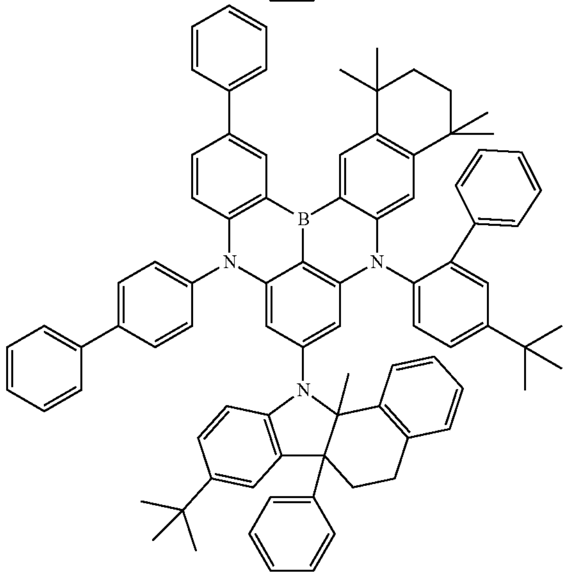

-continued
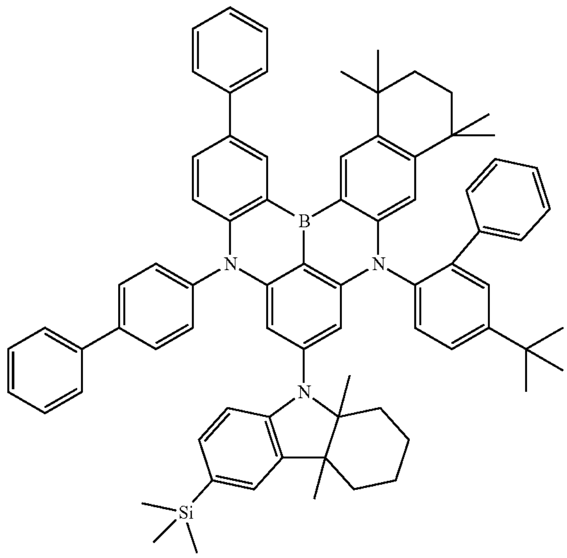
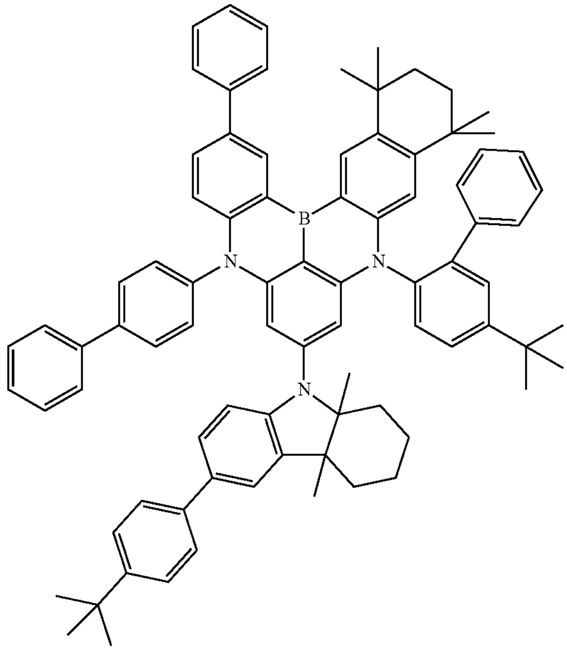
-continued
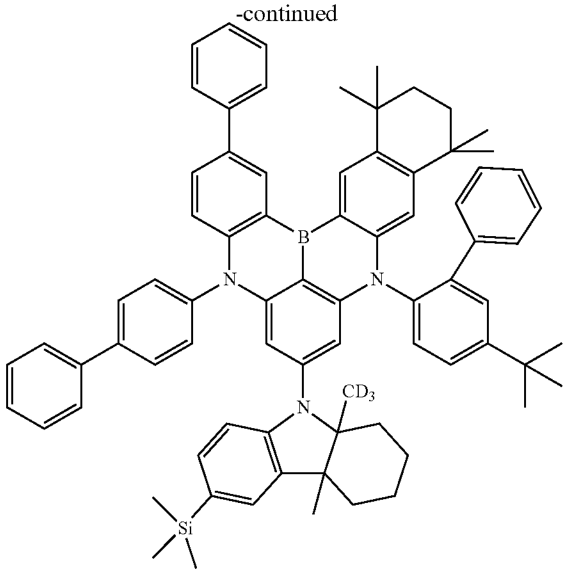
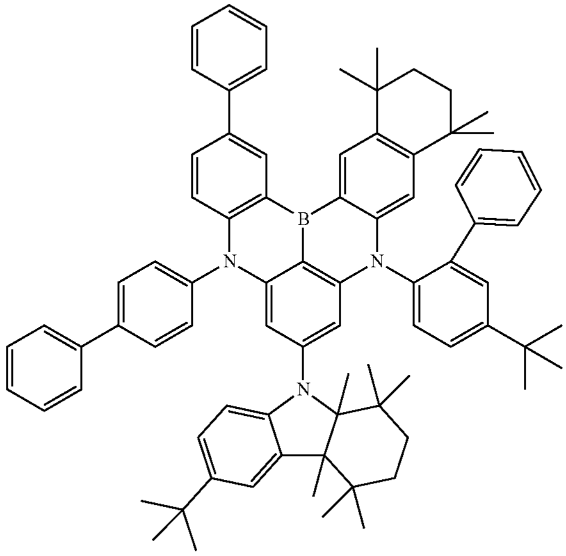
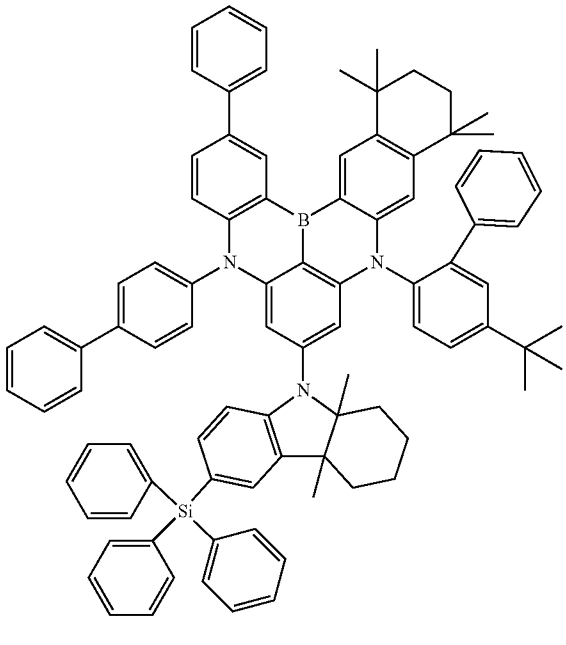

-continued
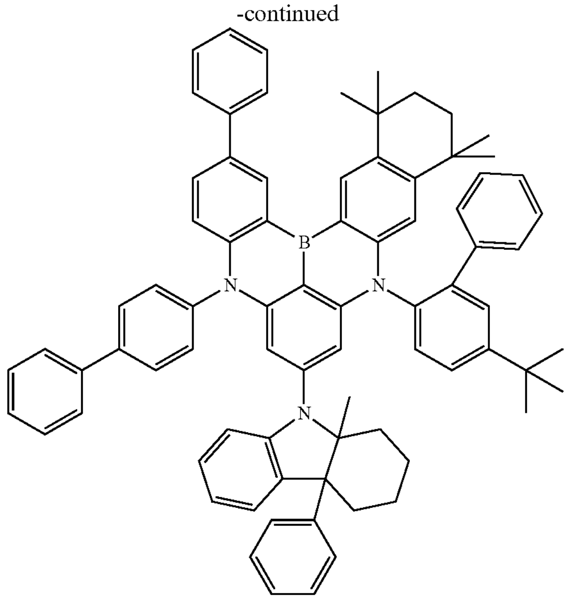
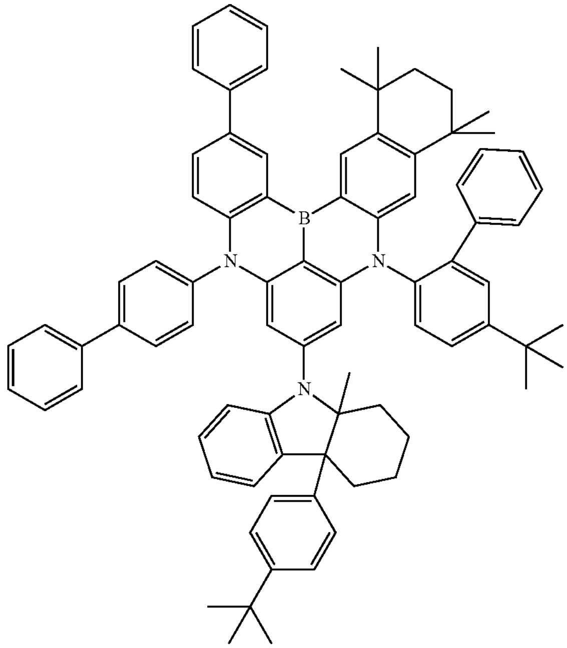
-continued
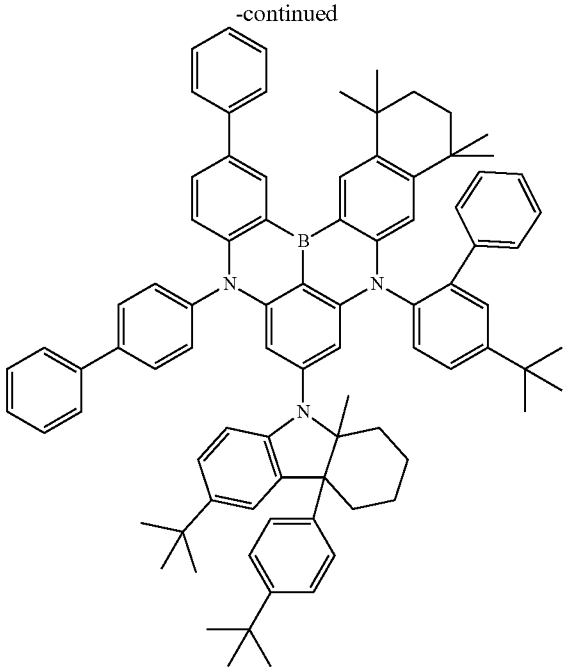
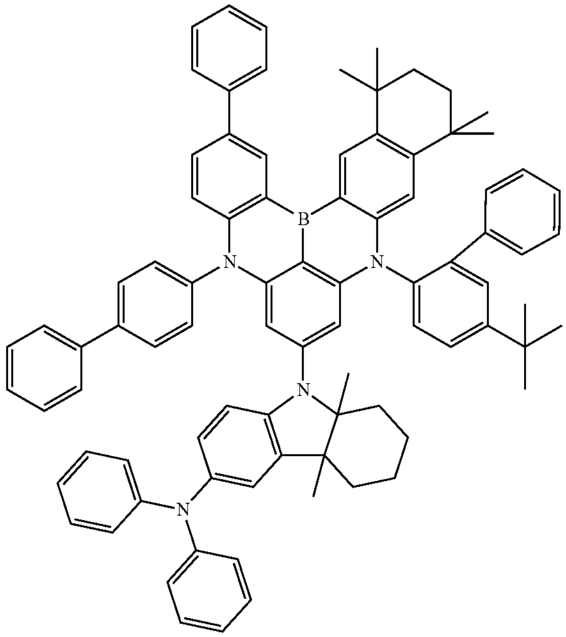

-continued
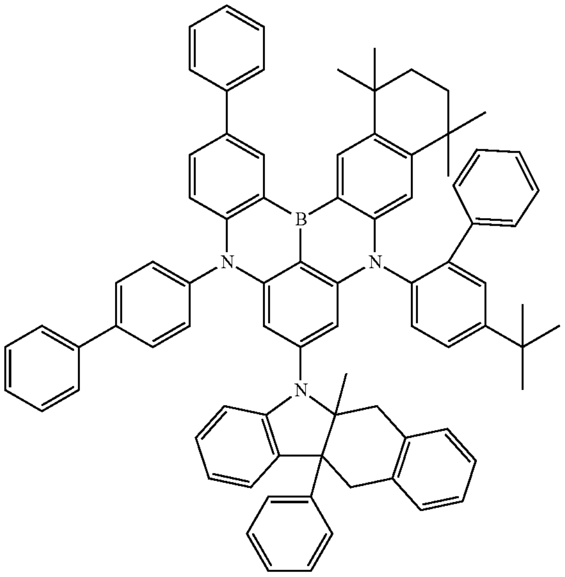
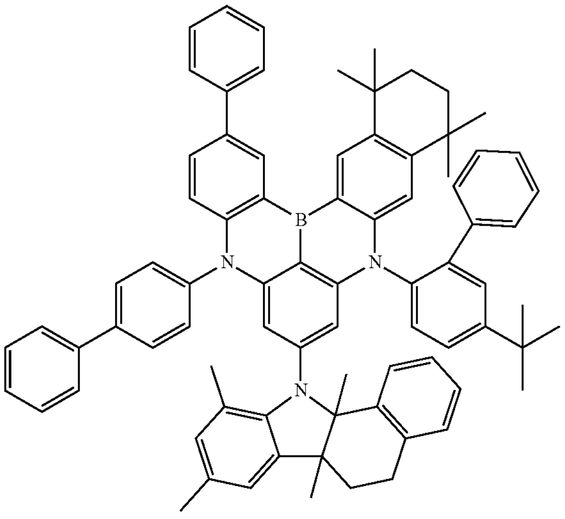
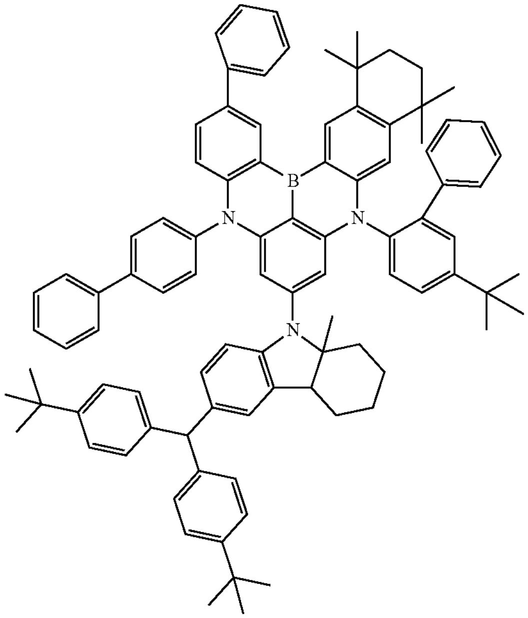
-continued
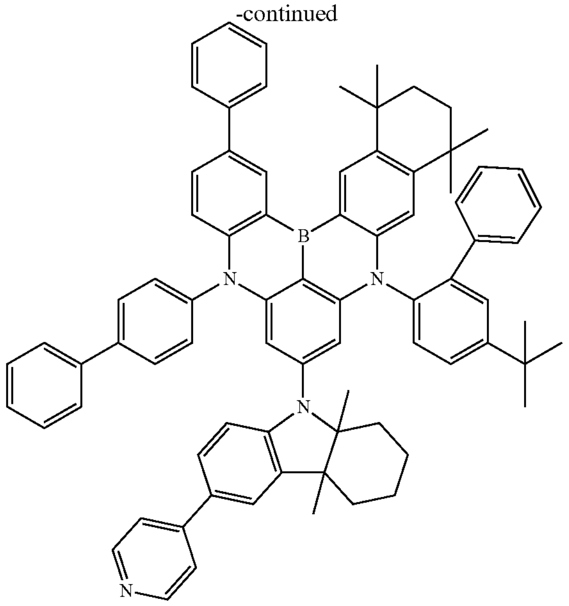
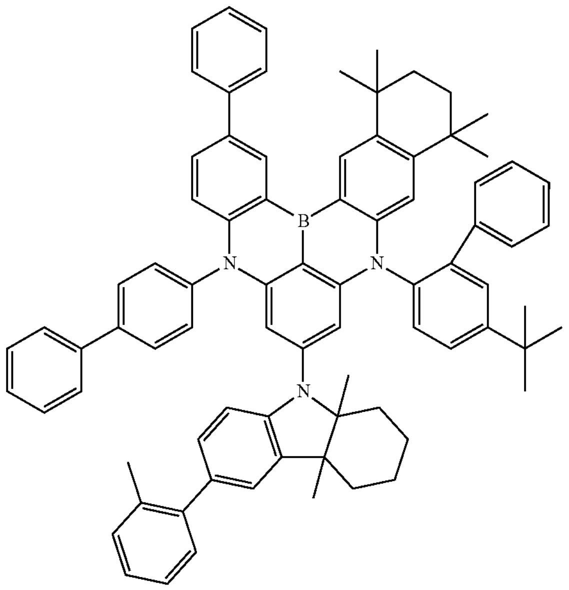
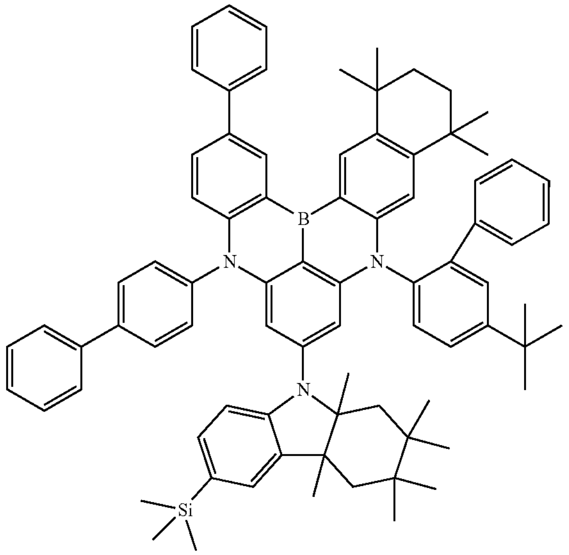

-continued
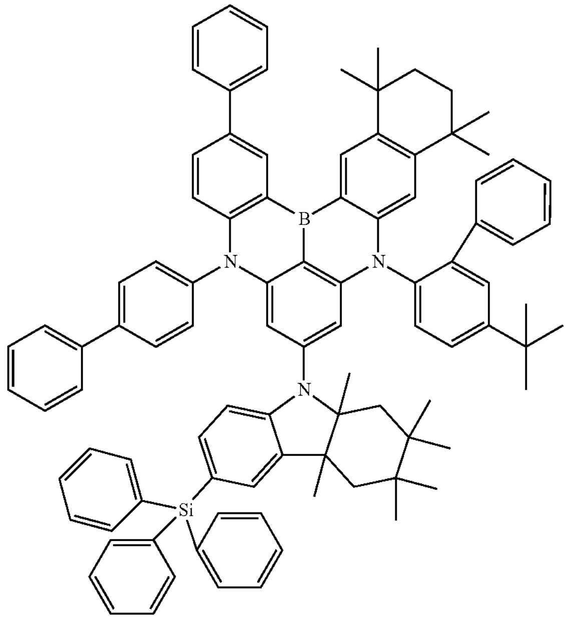
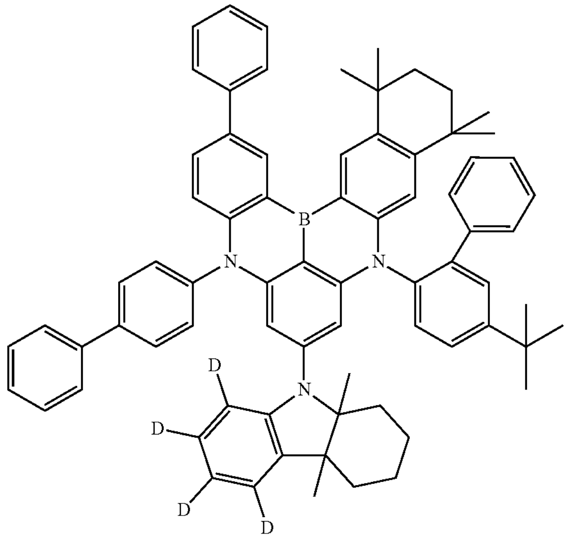
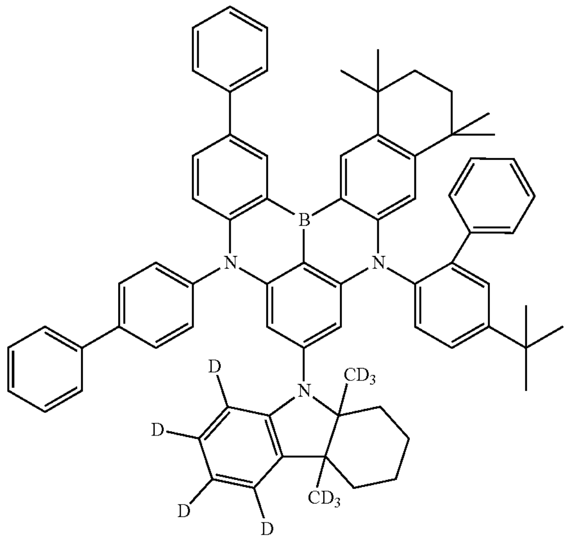
-continued
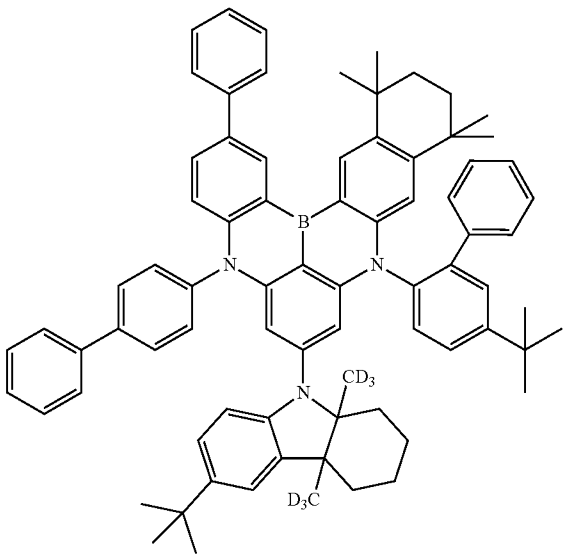
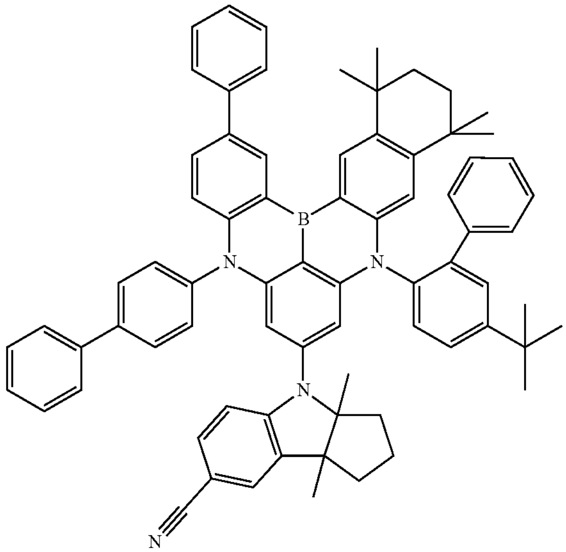
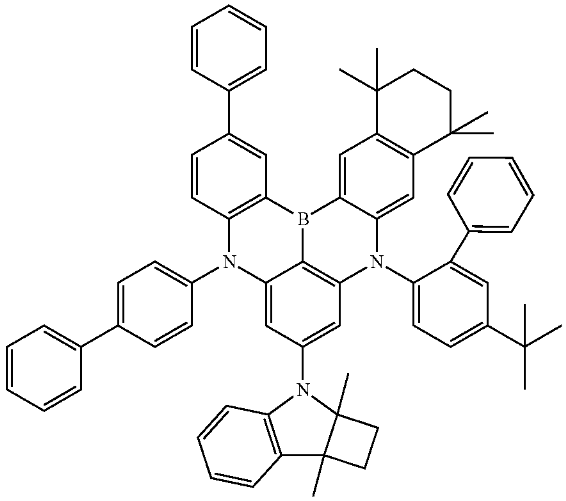

-continued
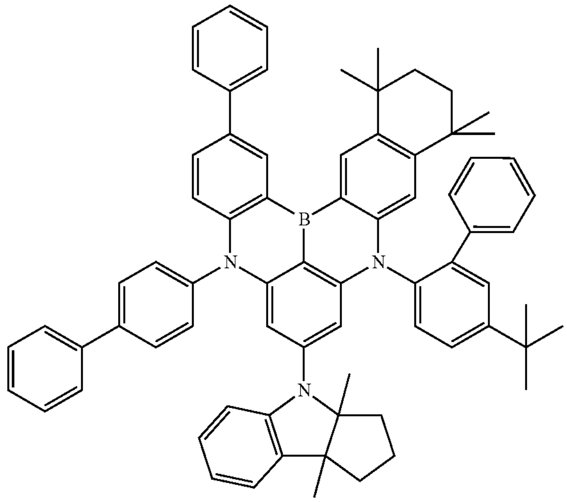
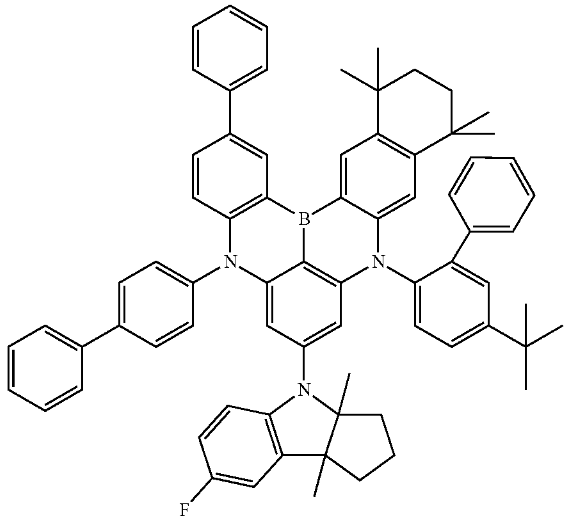
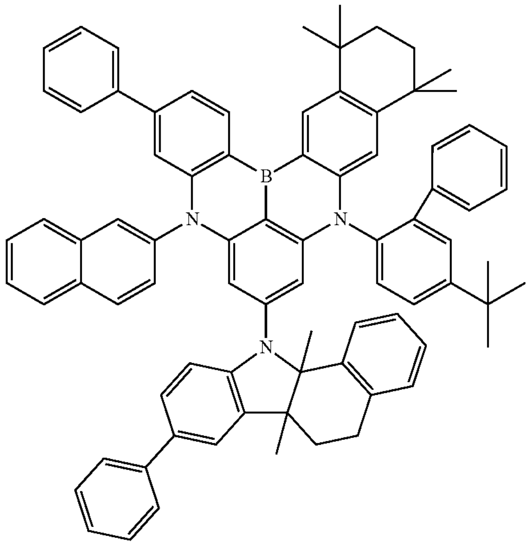
-continued
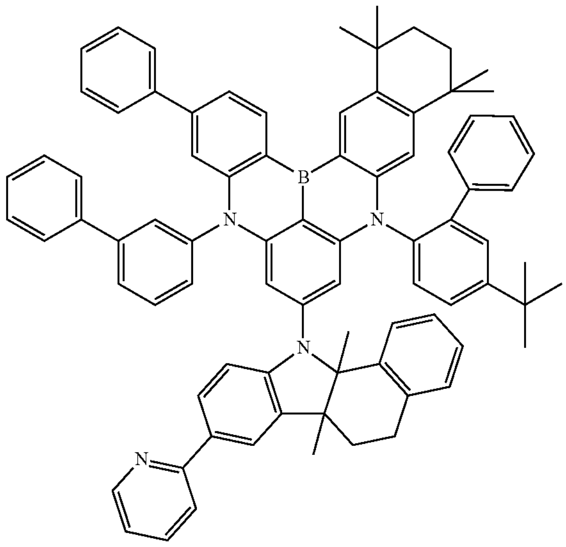
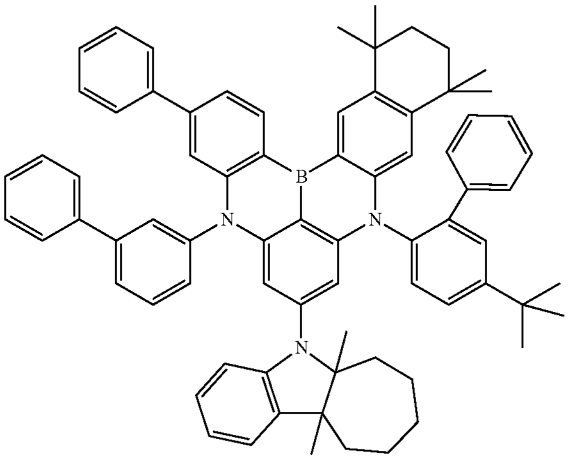
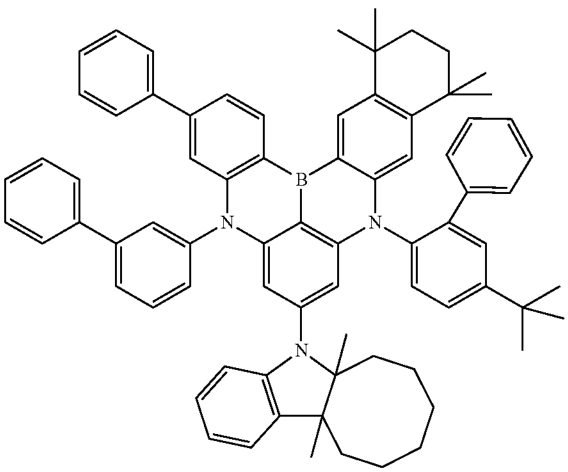

-continued
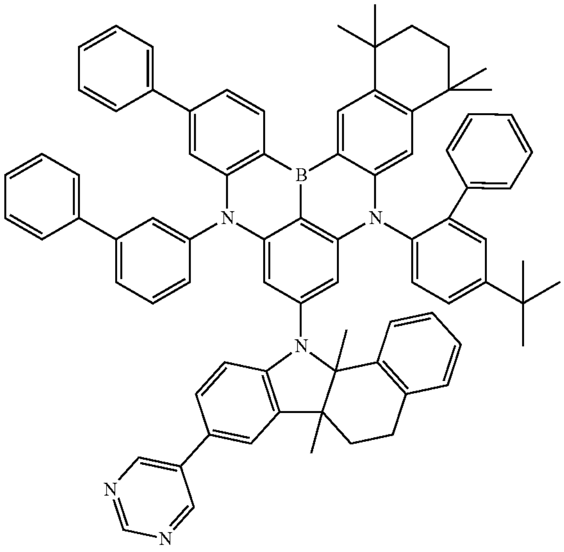
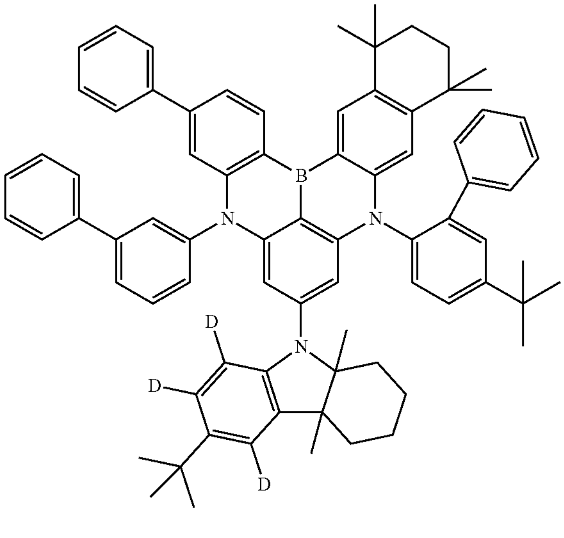
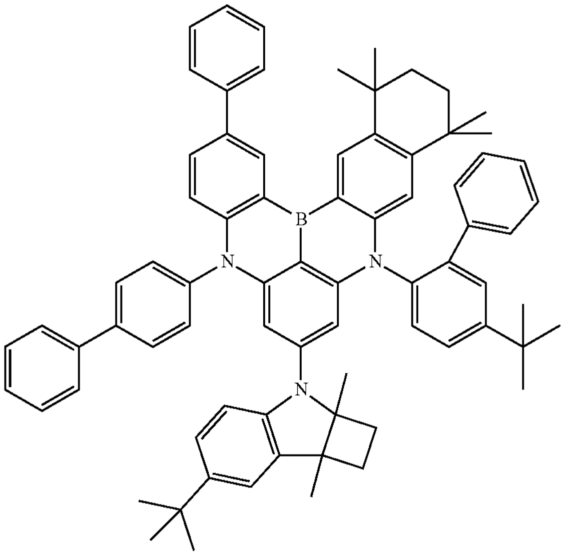
-continued
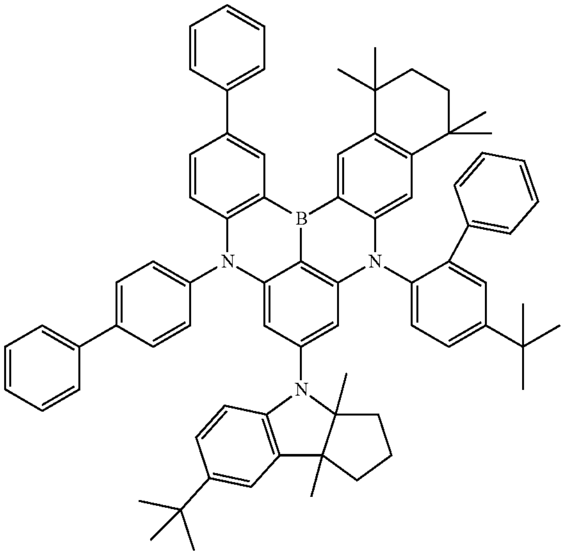
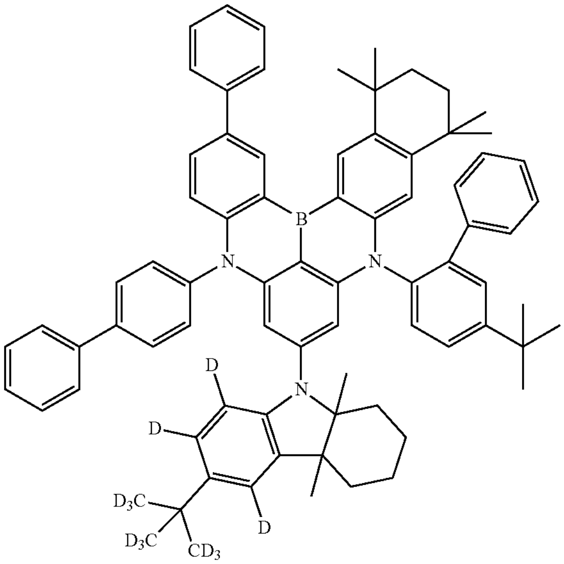
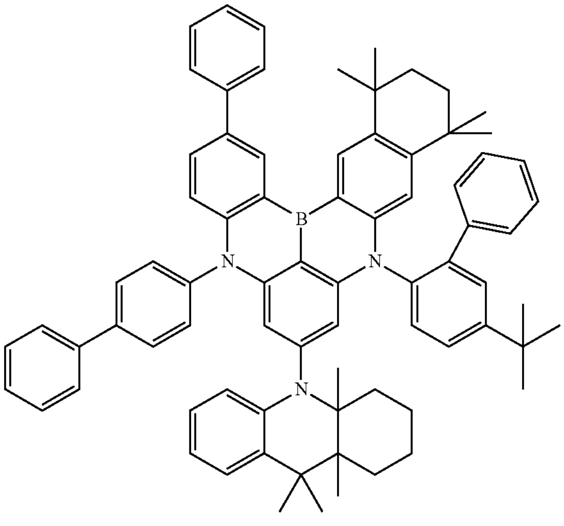

-continued
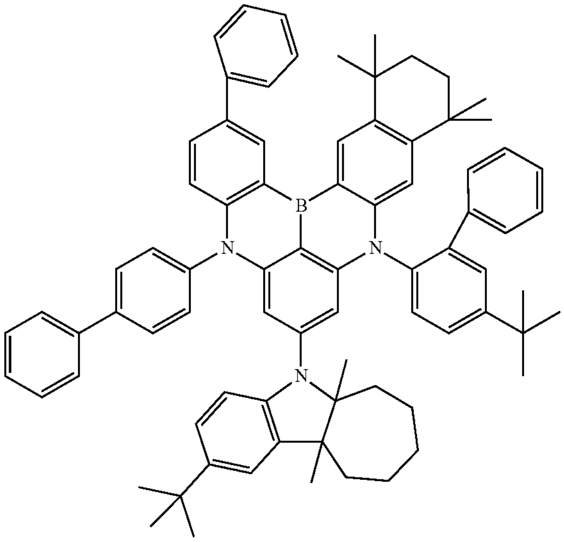
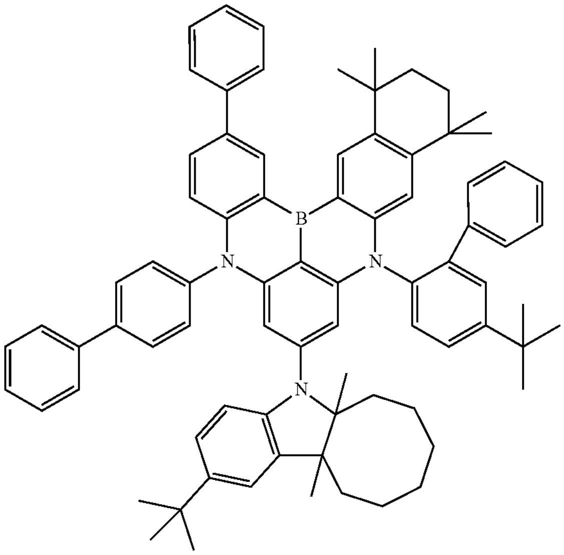
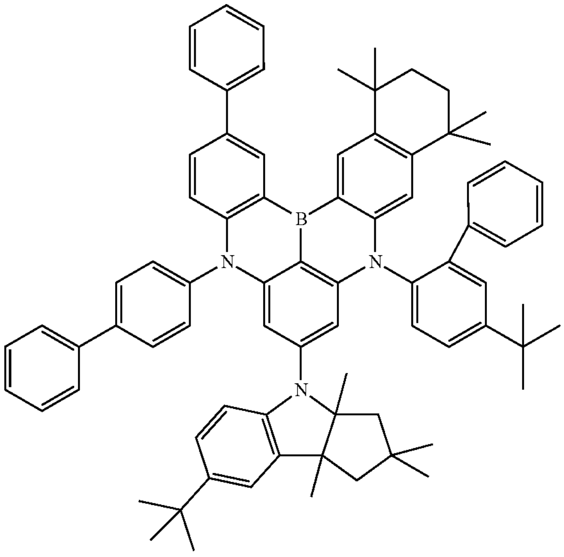
-continued
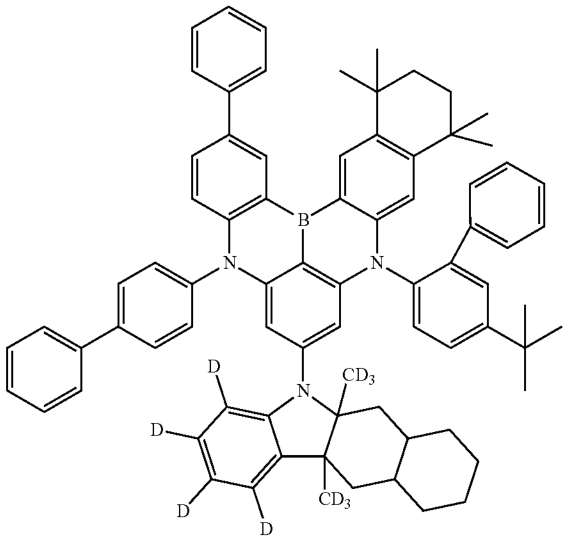
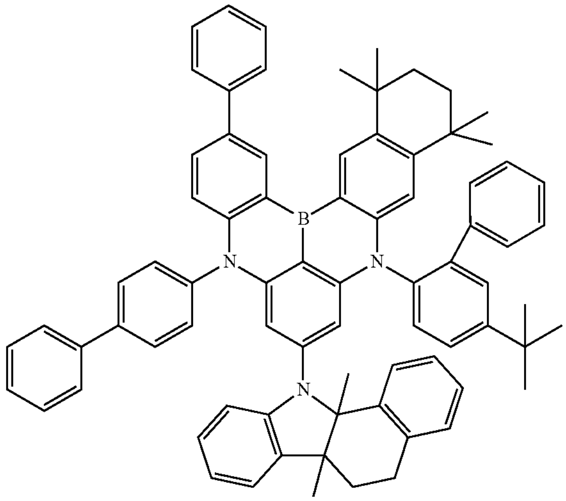
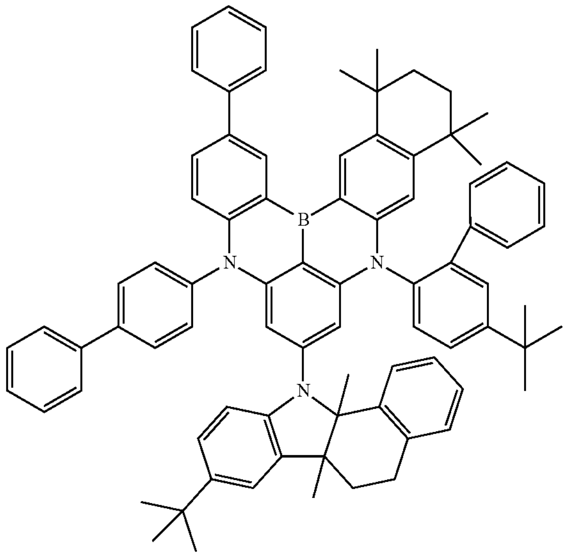

-continued
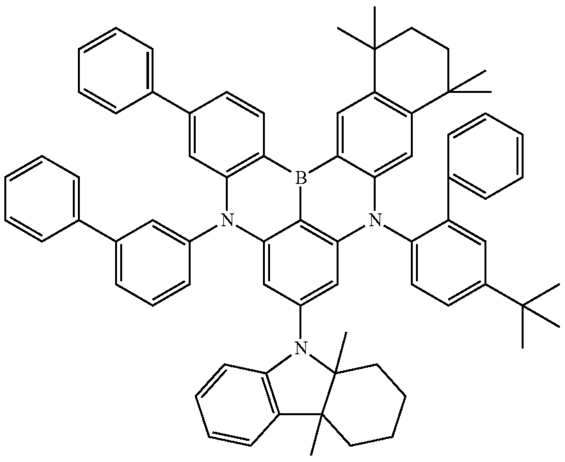
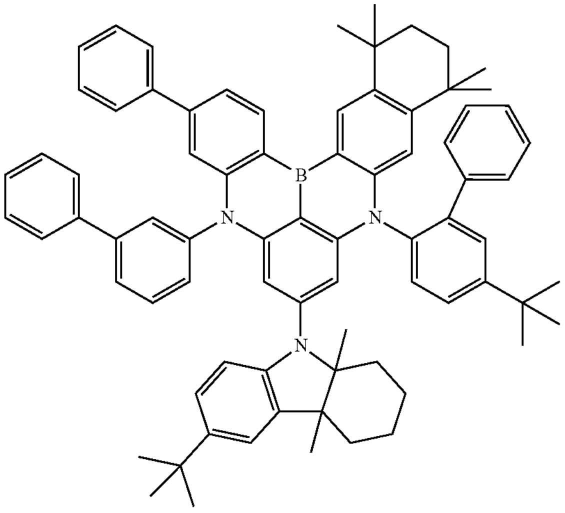
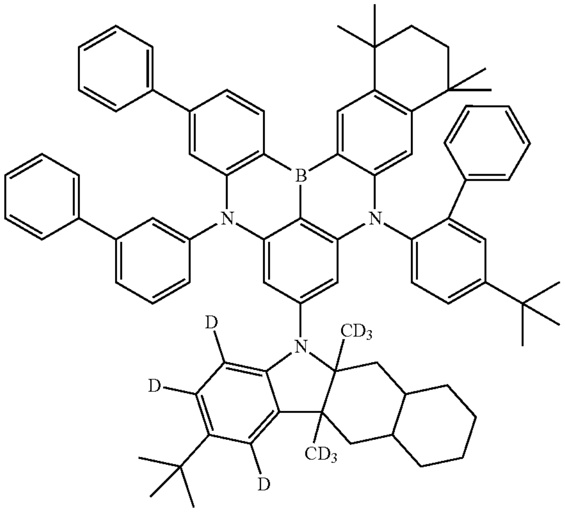
-continued
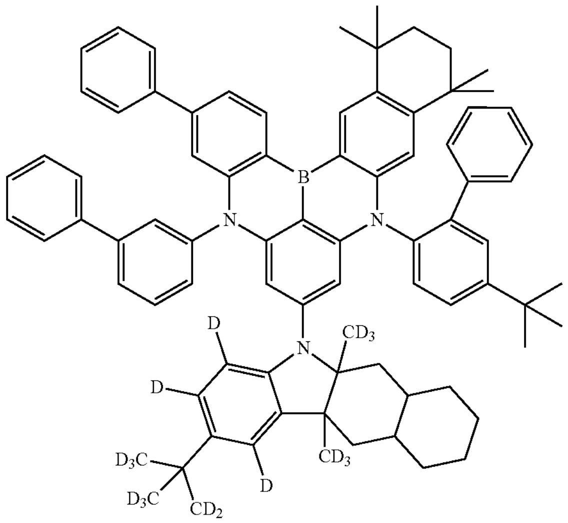
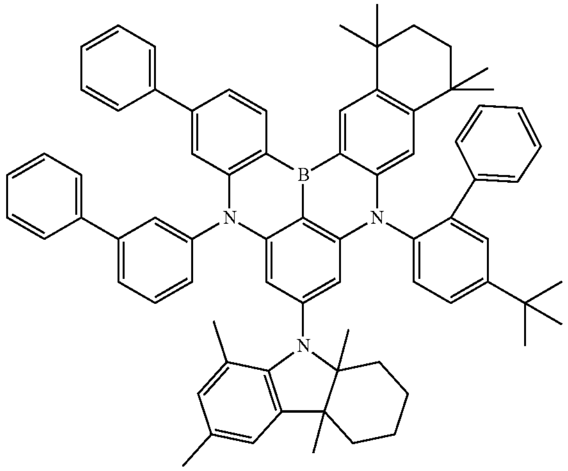
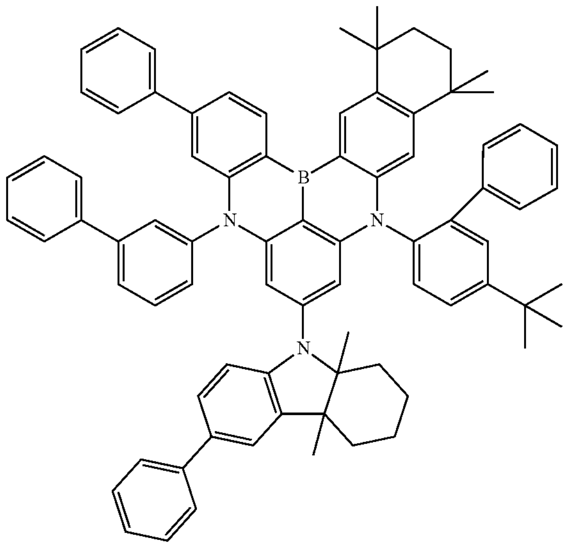

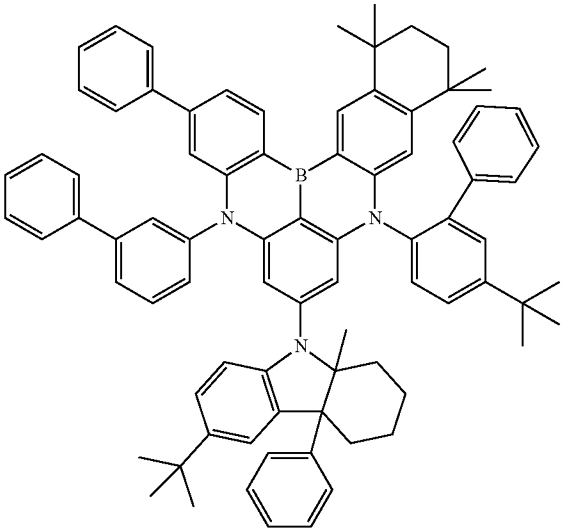
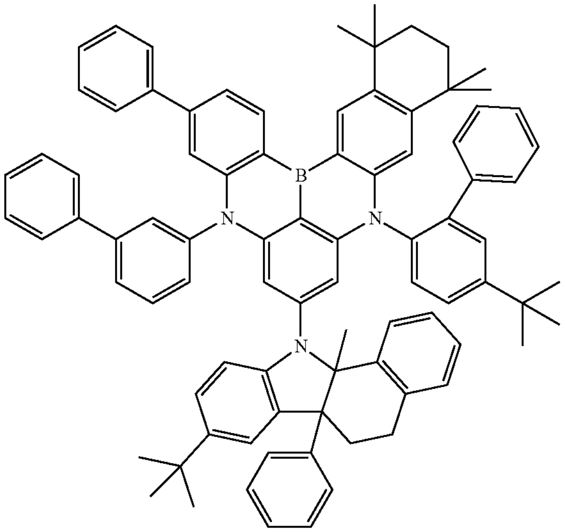
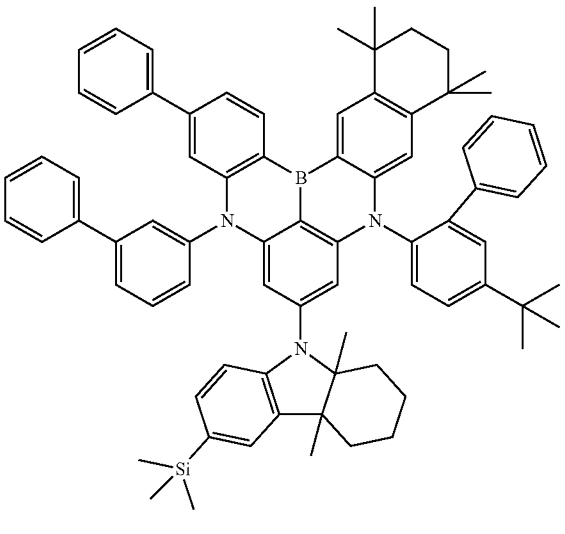
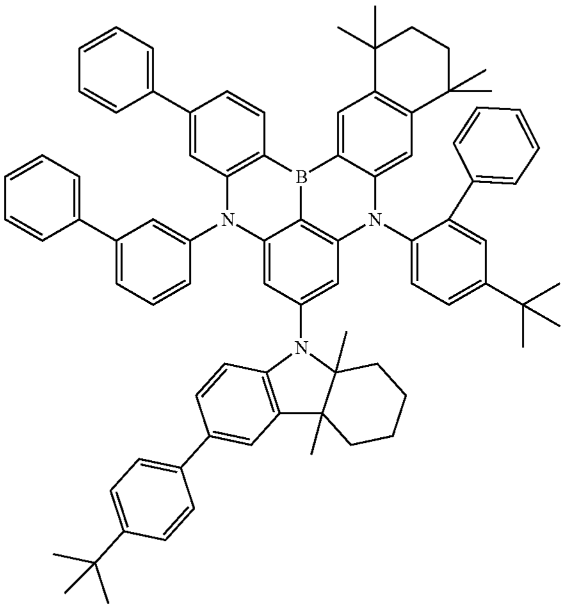
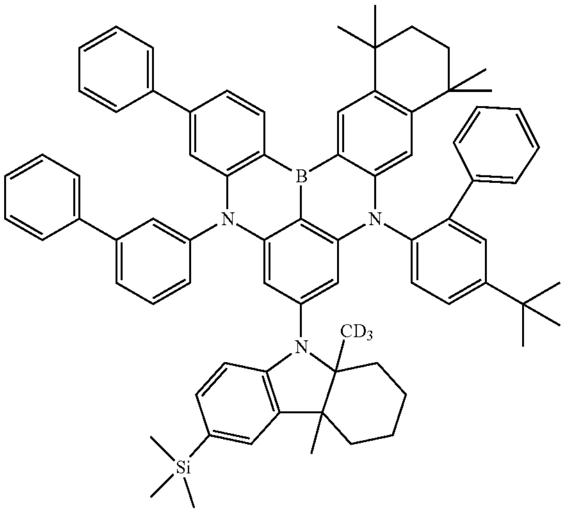
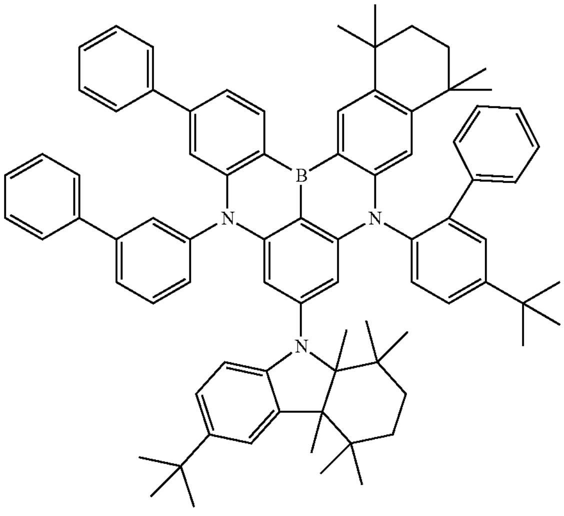

-continued
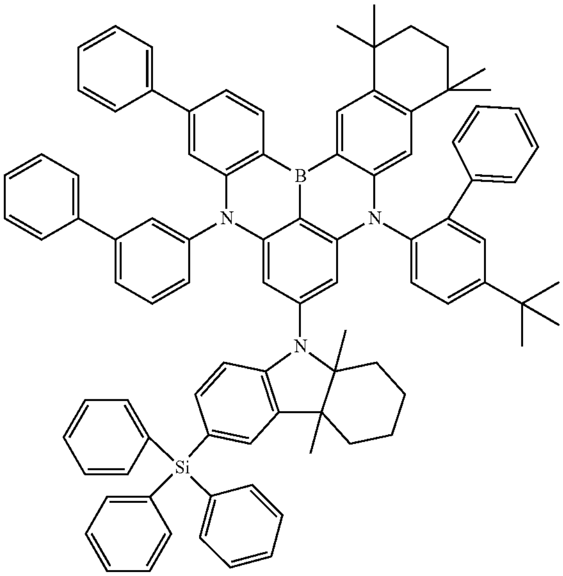
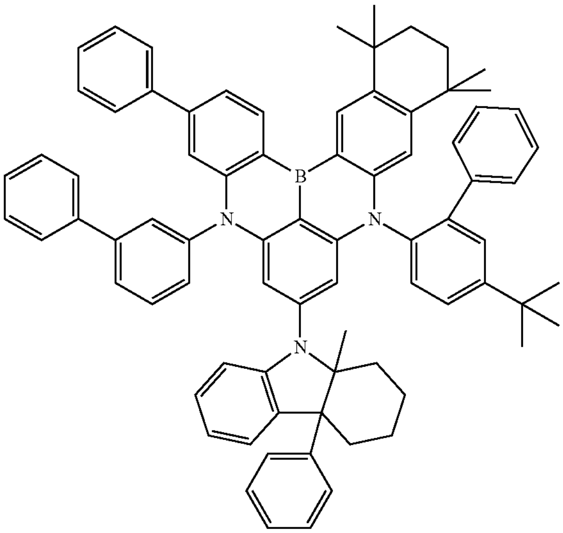
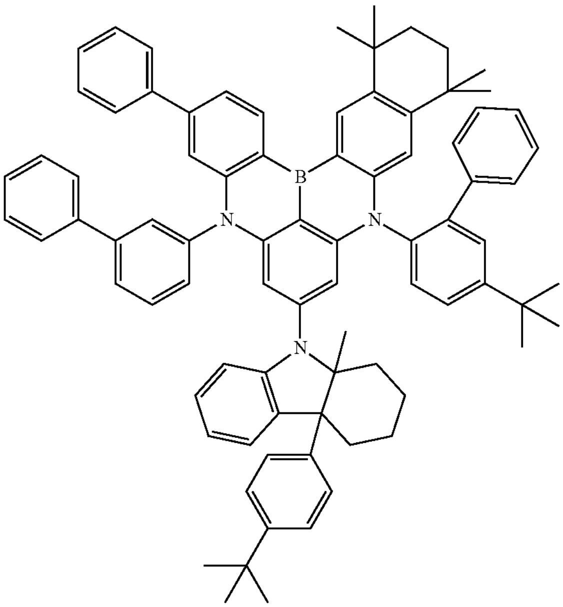
-continued
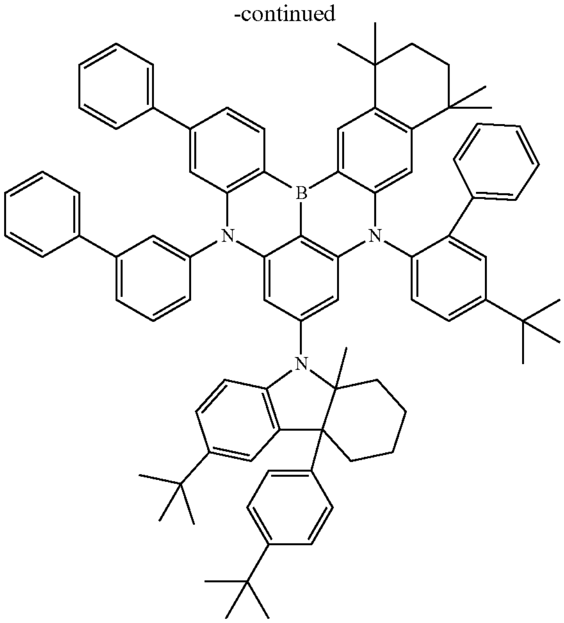
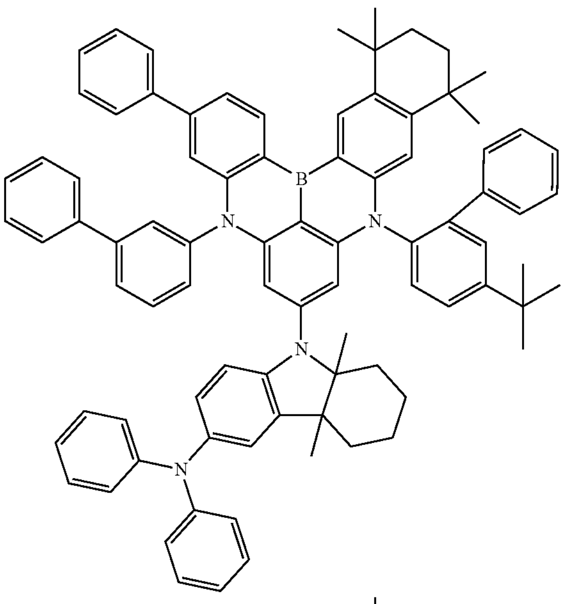
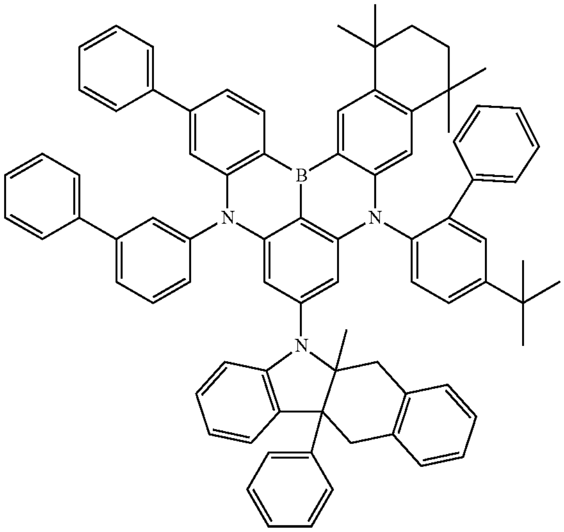

-continued
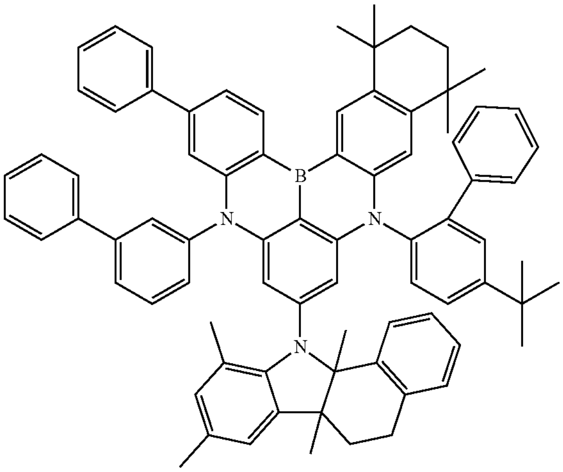
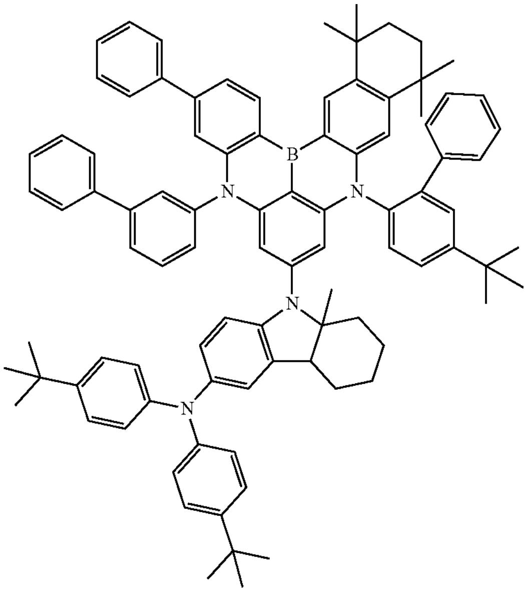
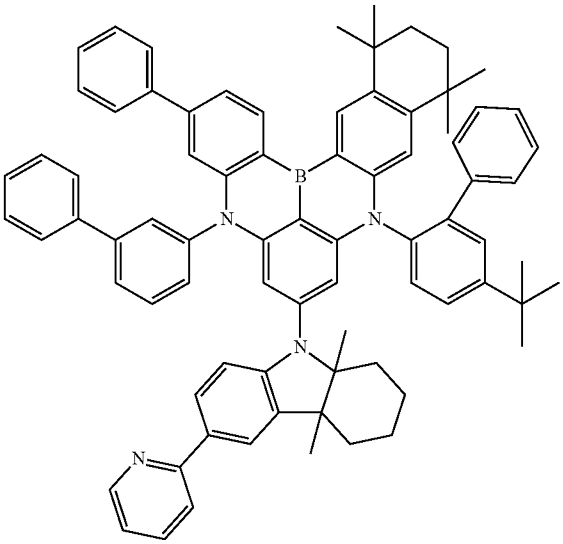
-continued
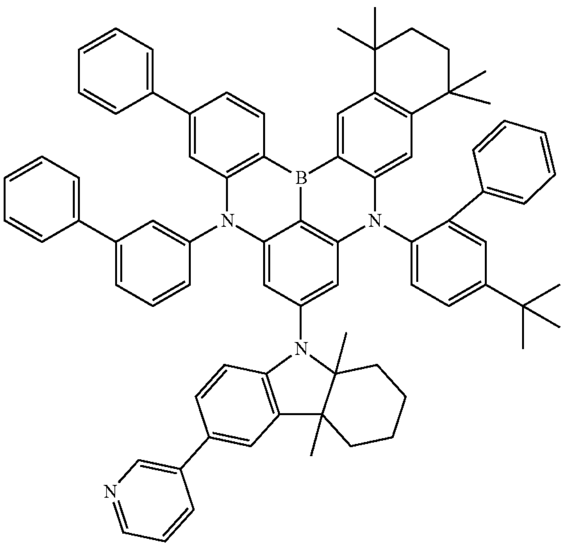
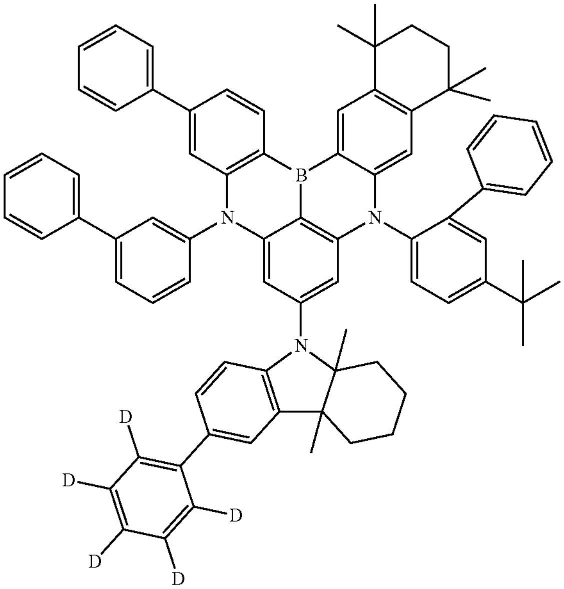
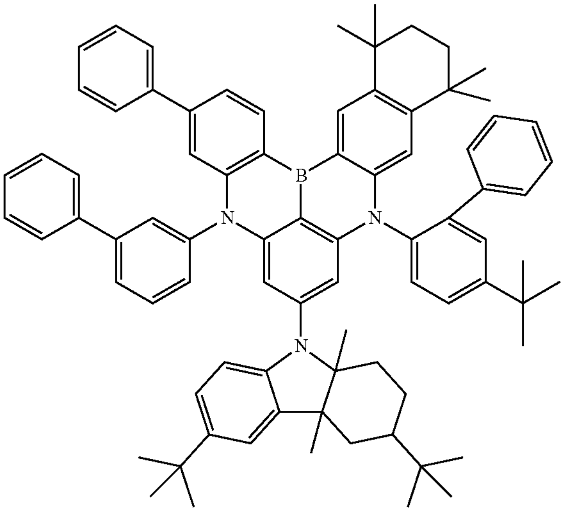

-continued
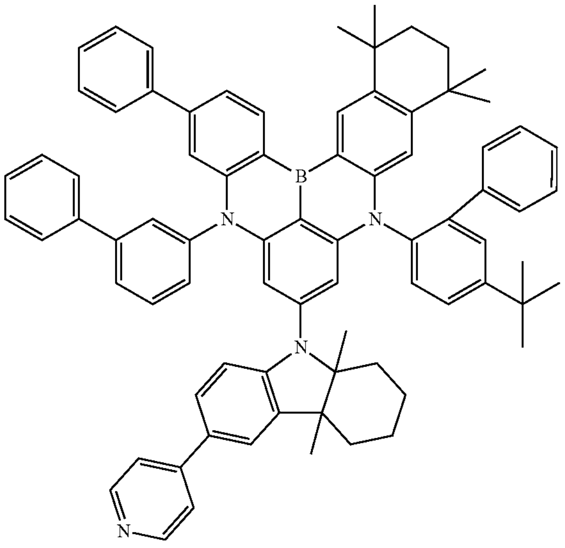
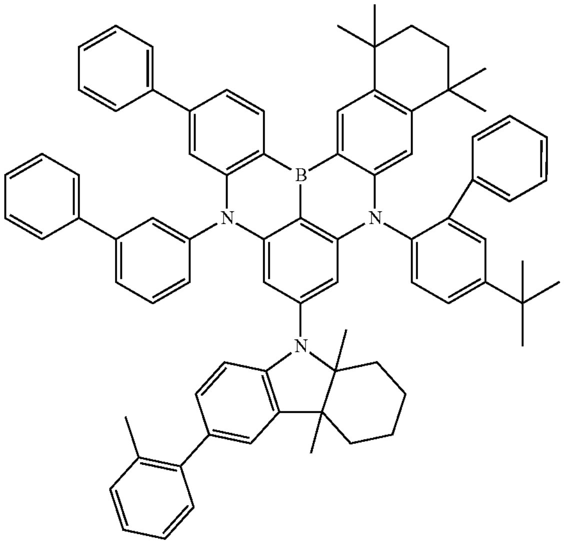
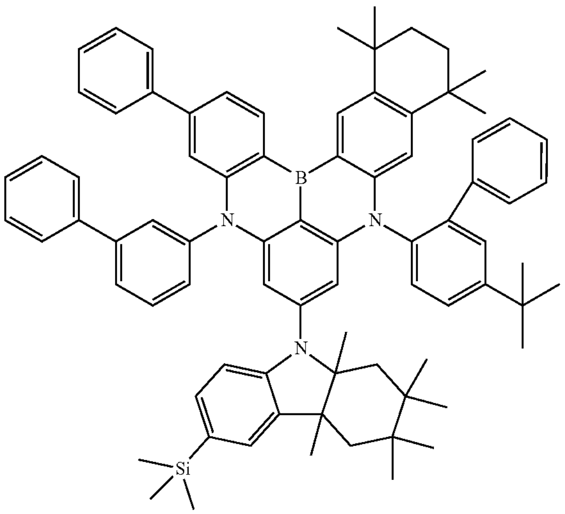
-continued
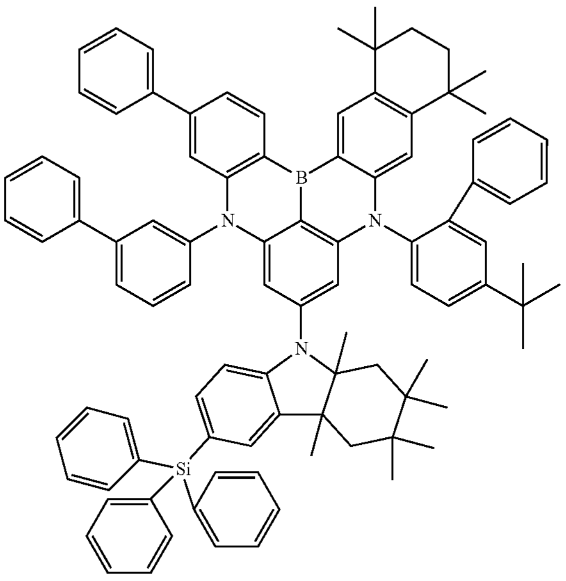
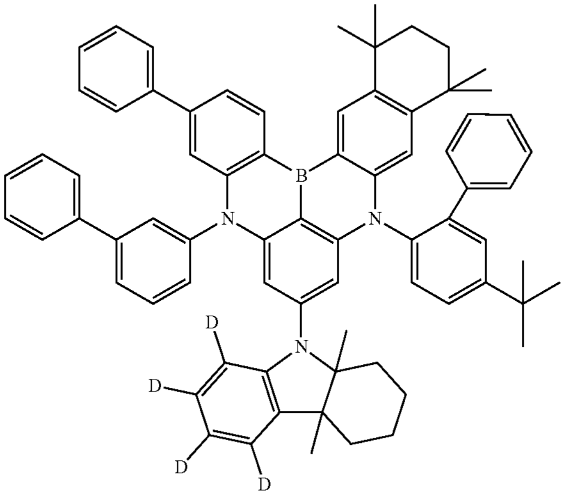
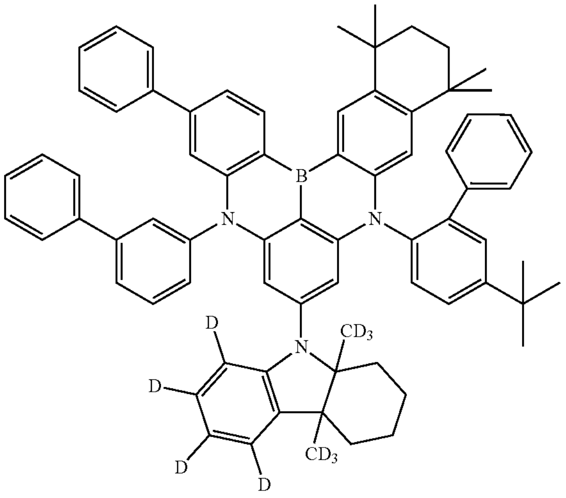

-continued
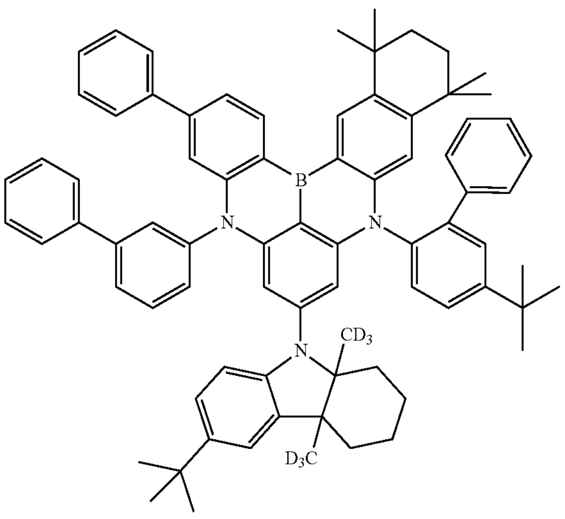
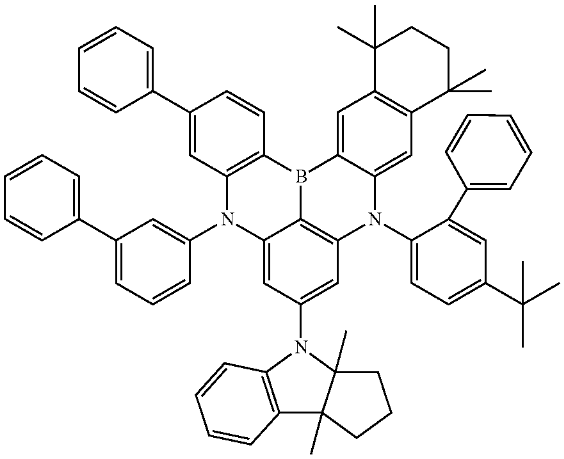
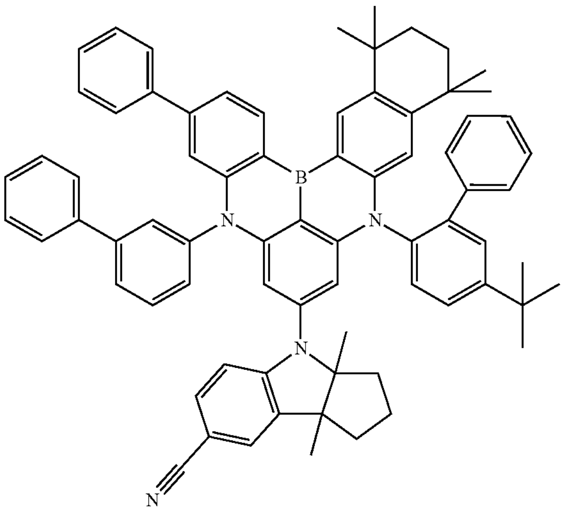
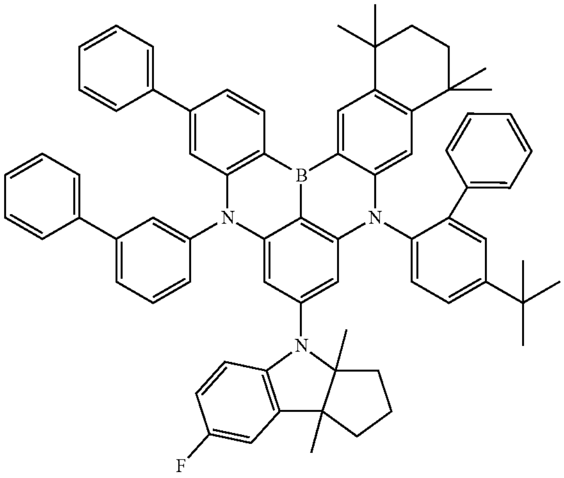
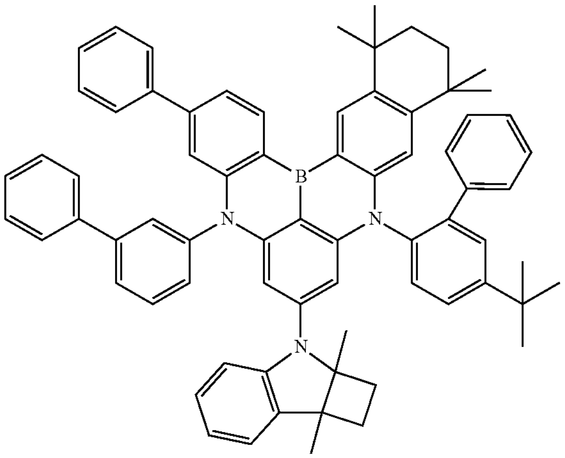
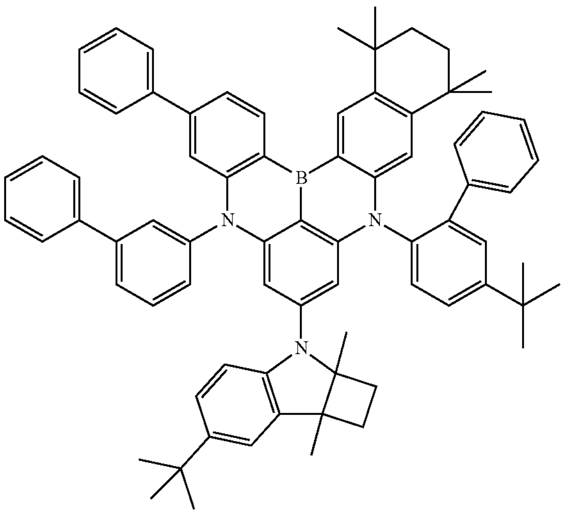
-continued -continued
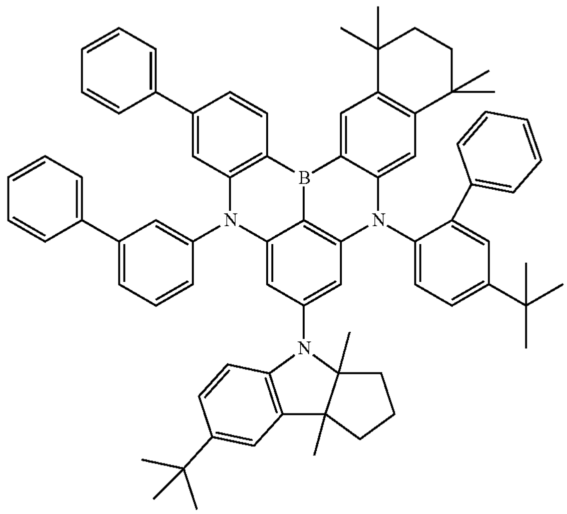
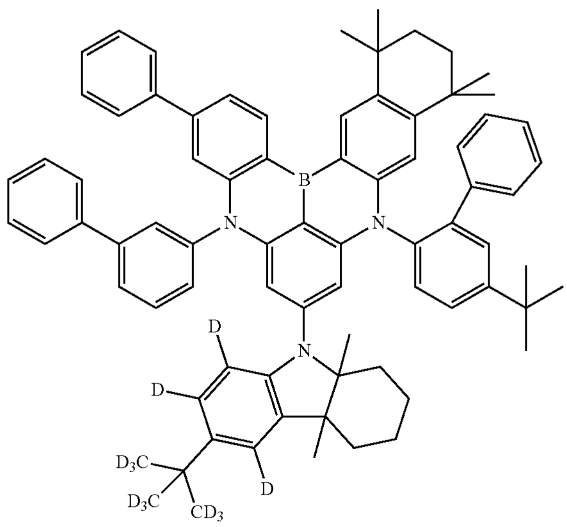
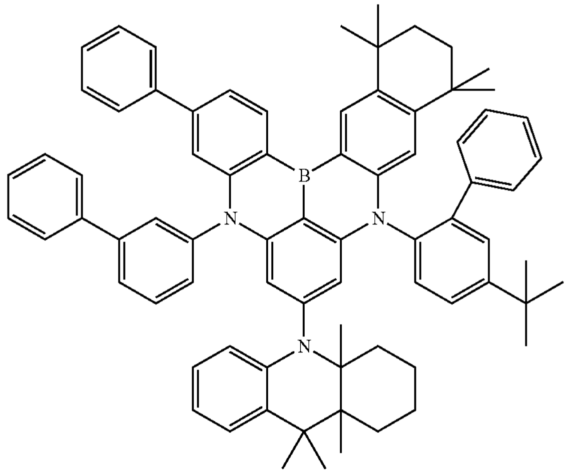
-continued
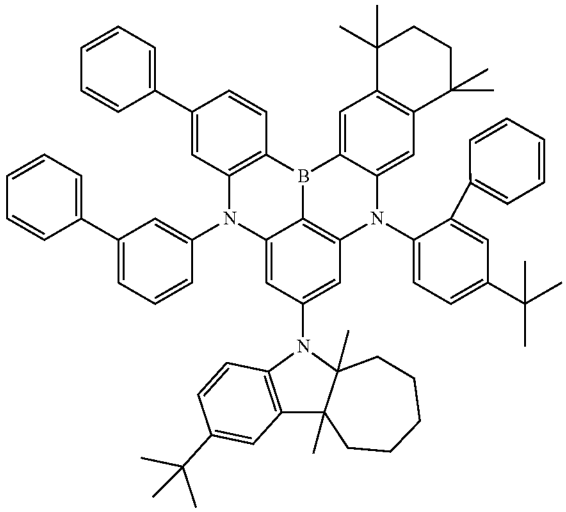
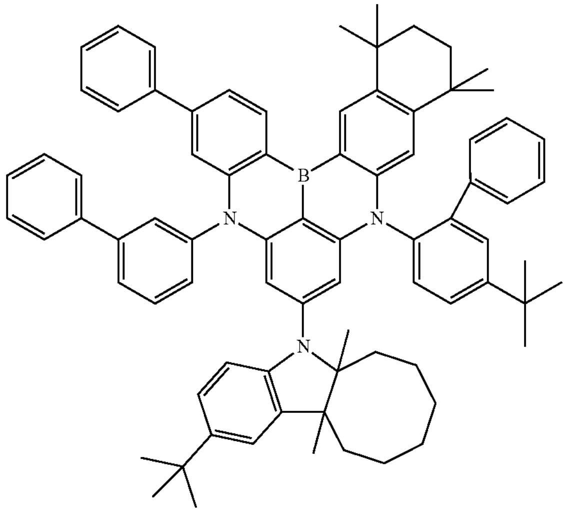
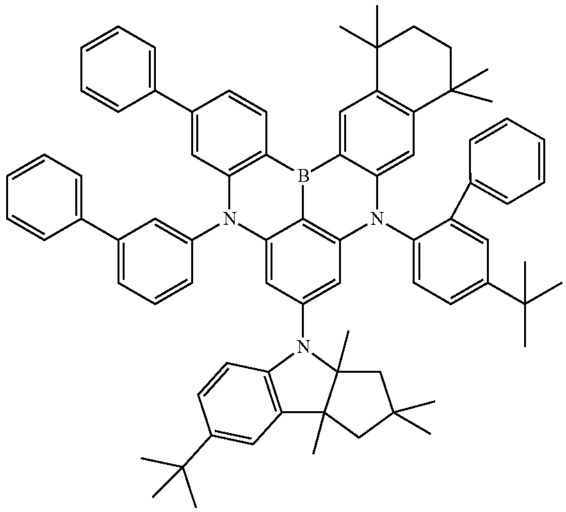

-continued
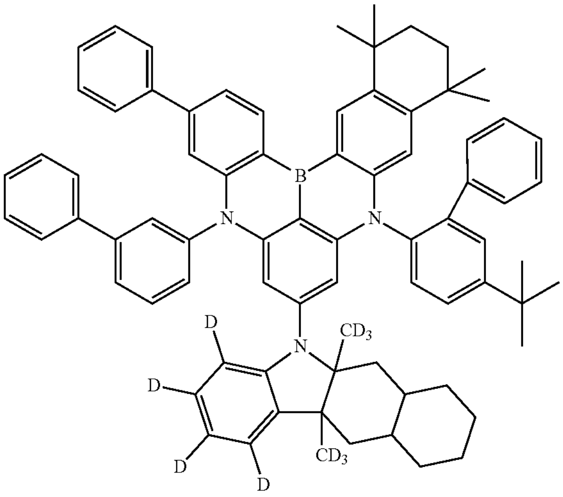
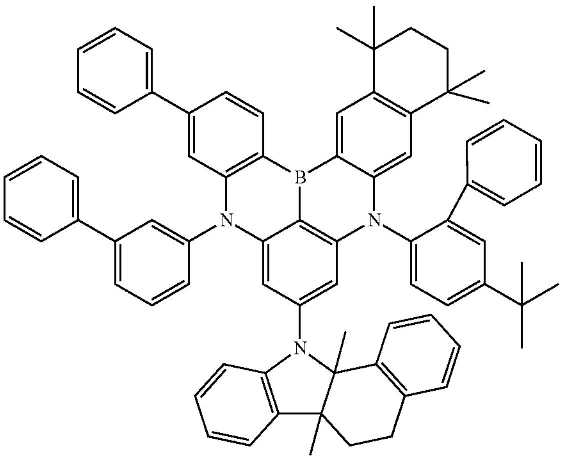
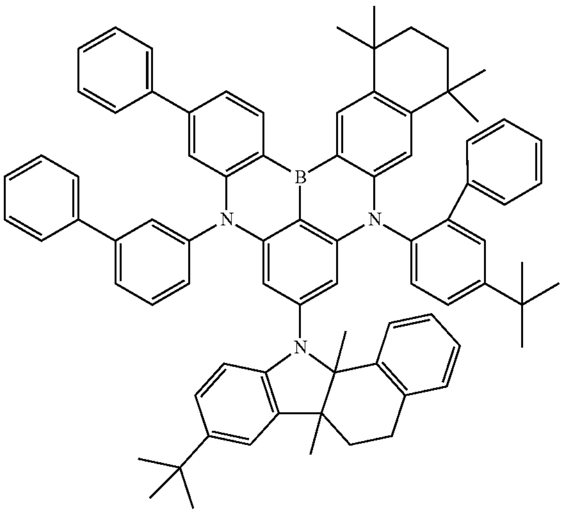
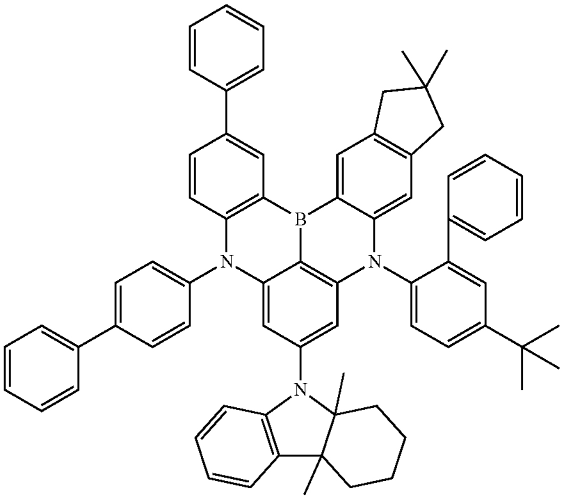
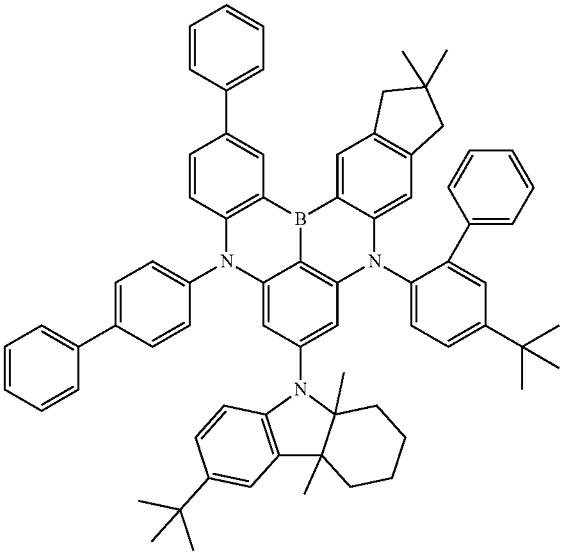
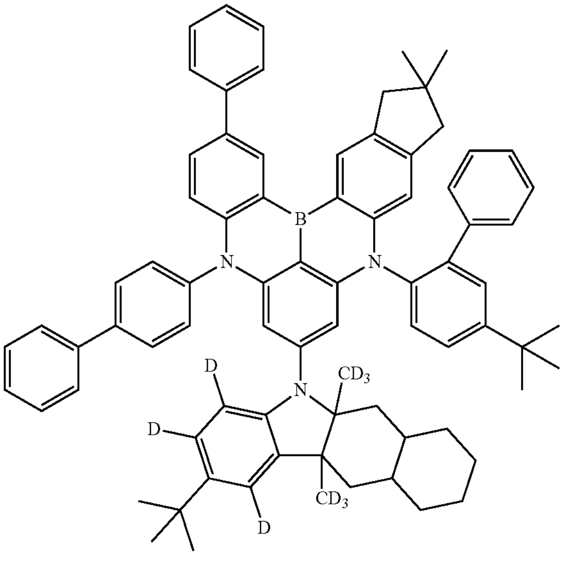

-continued
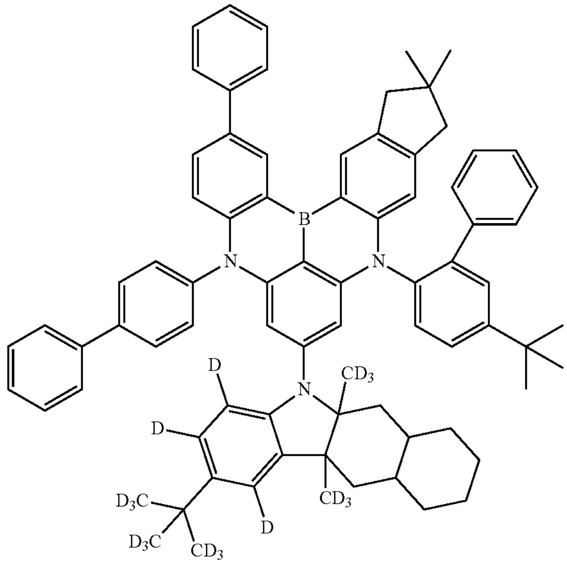
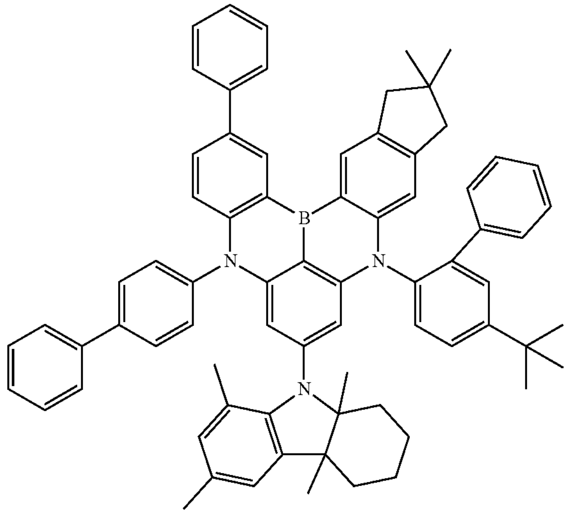
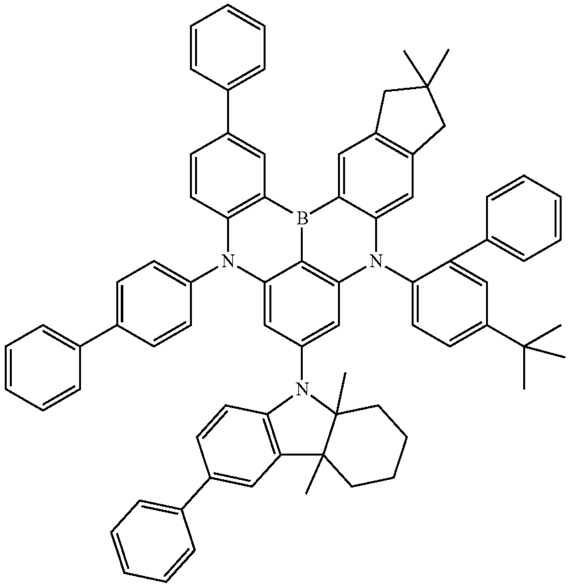
-continued
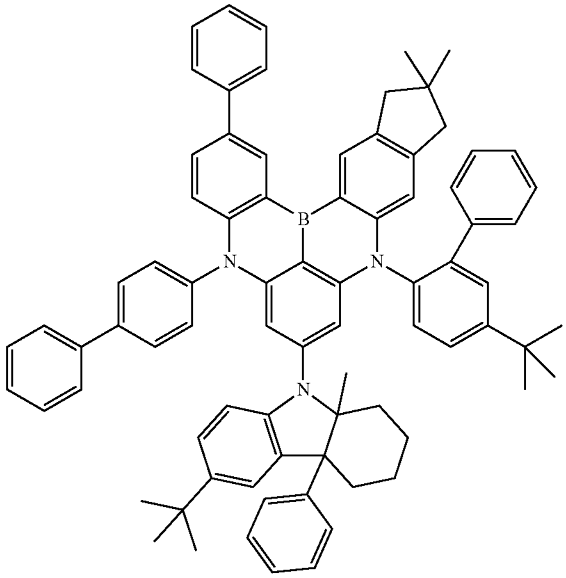
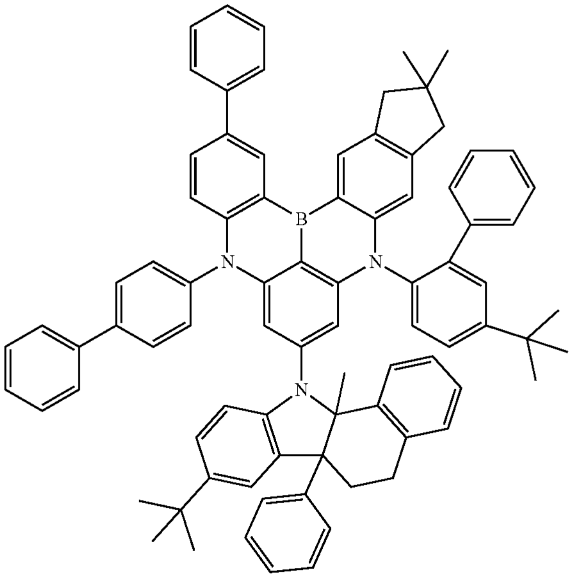
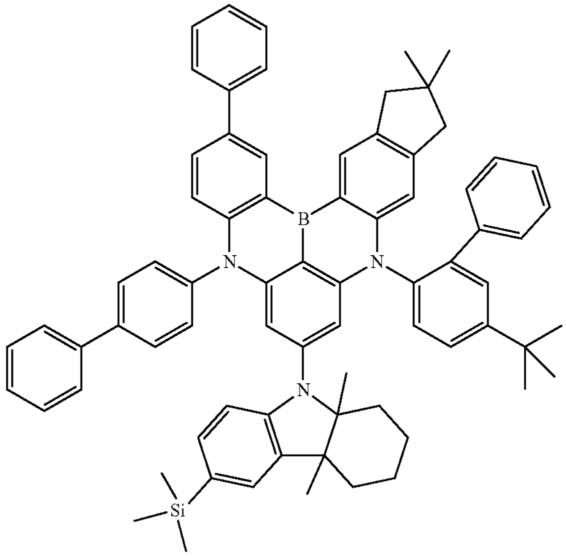

-continued
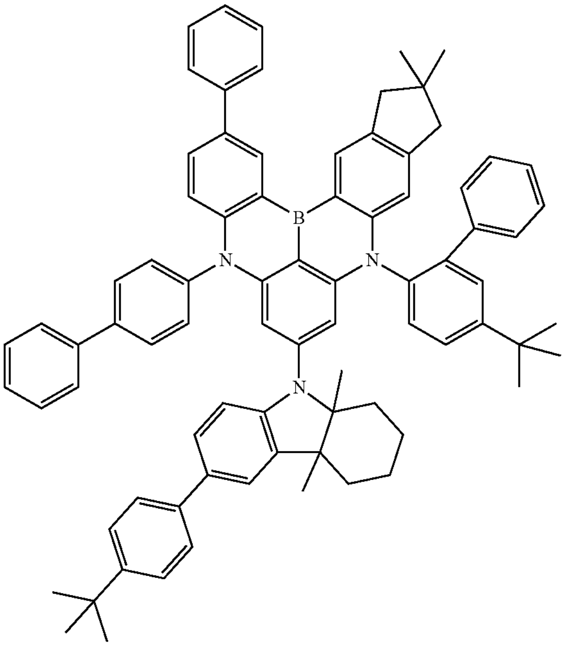
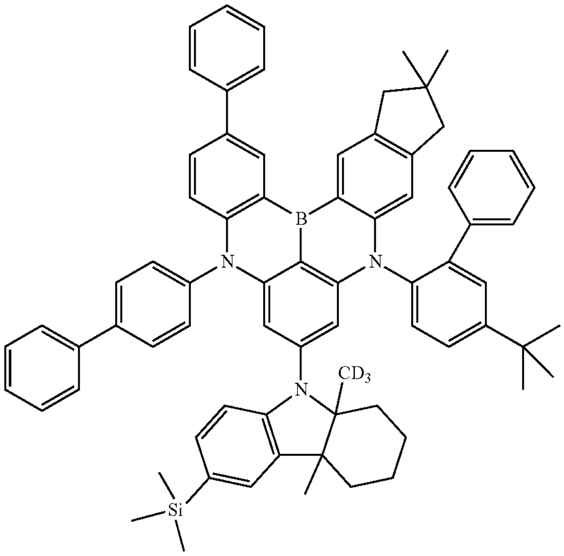
-continued
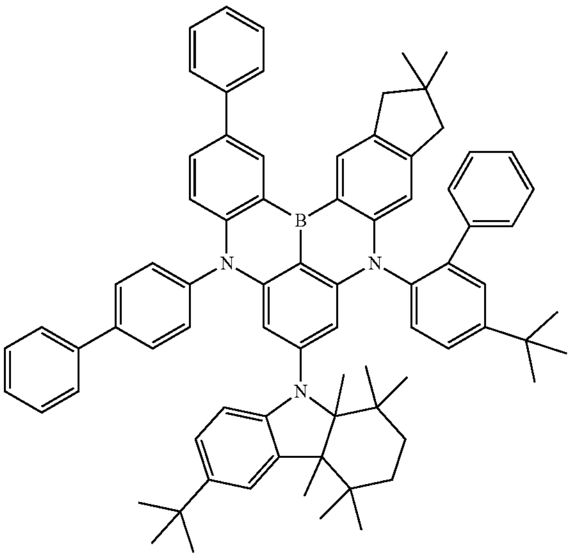
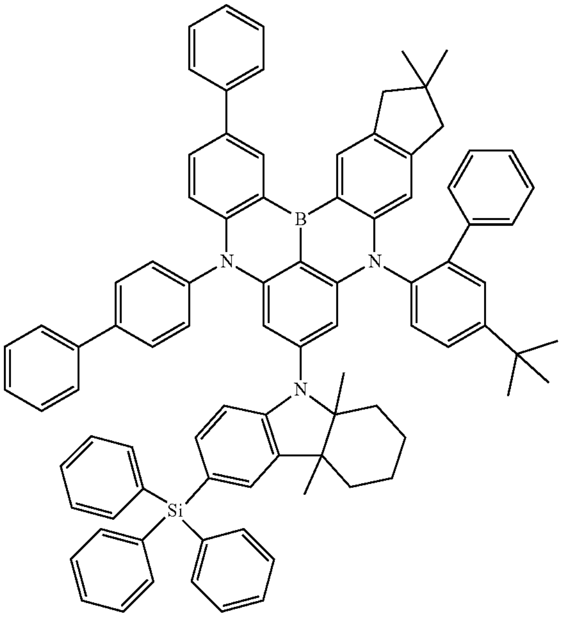

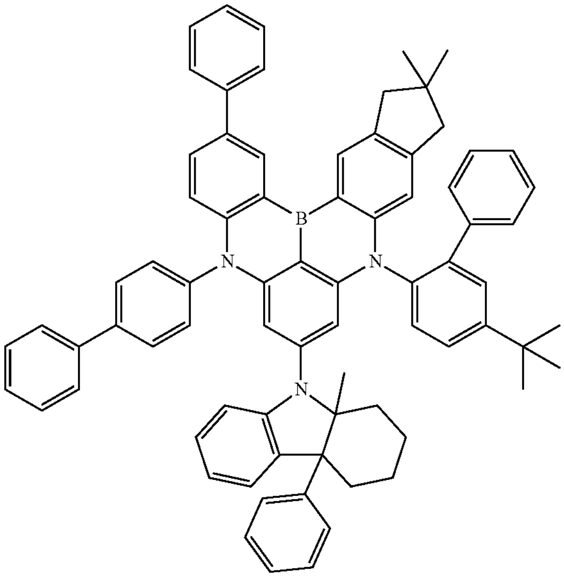
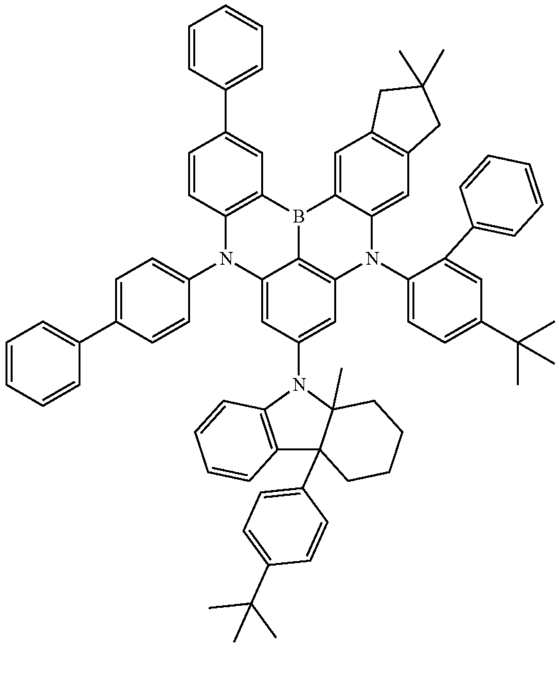
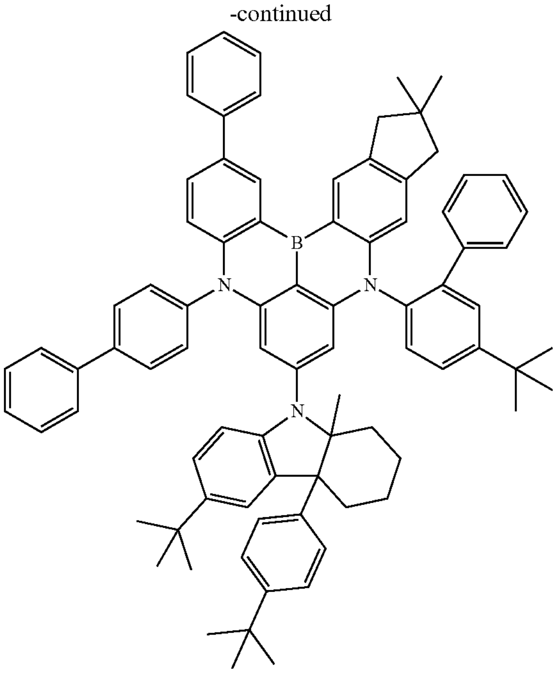
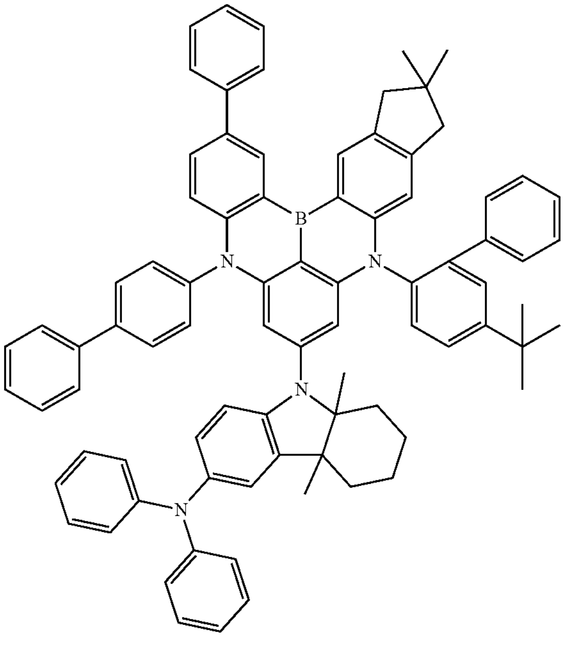

-continued
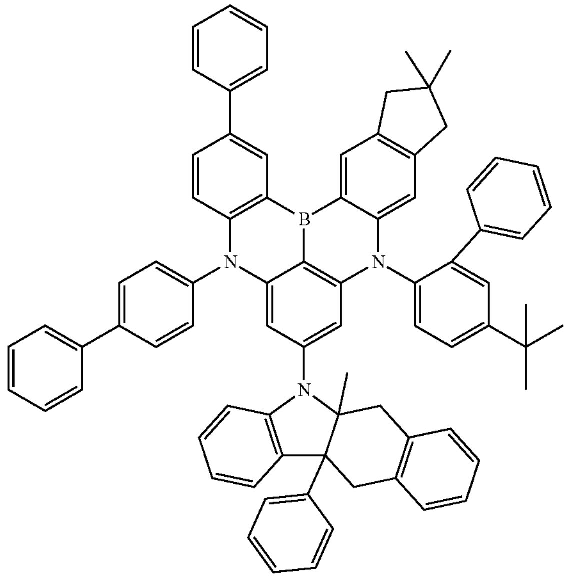
-continued
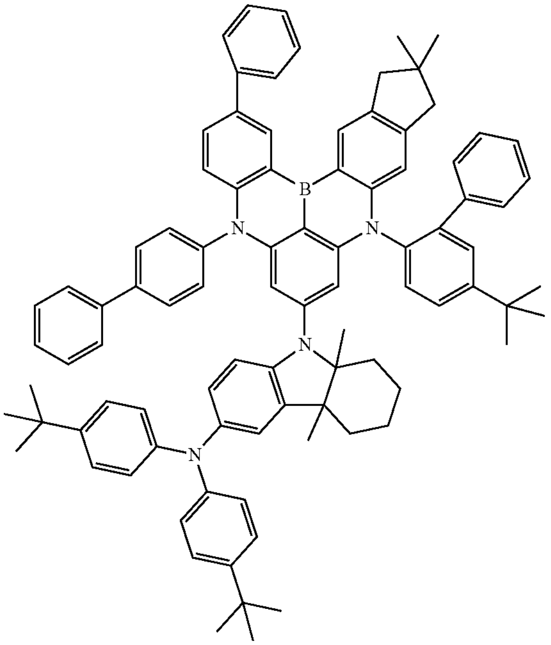
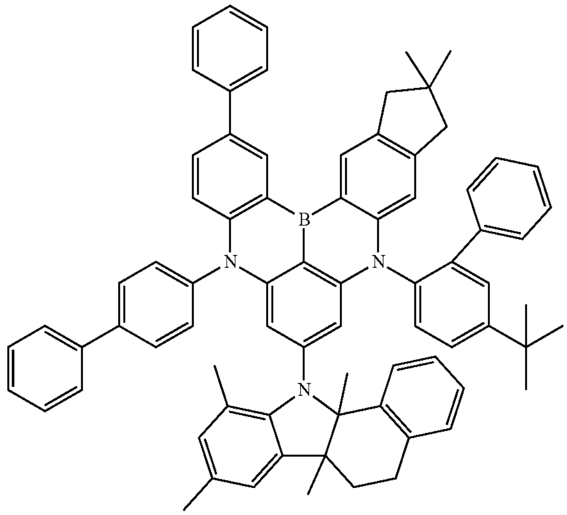
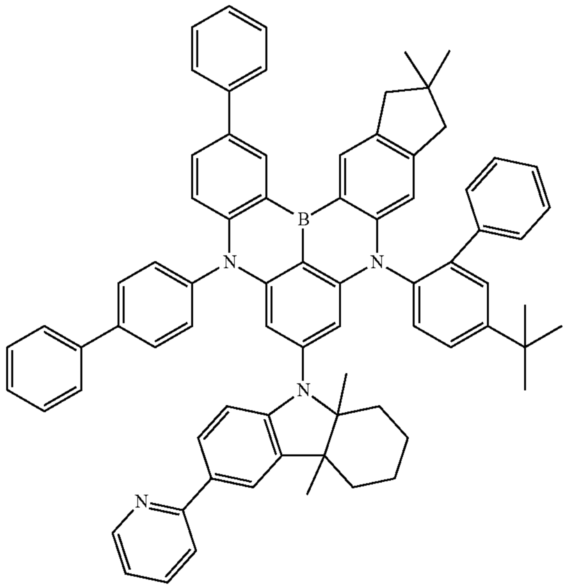

-continued
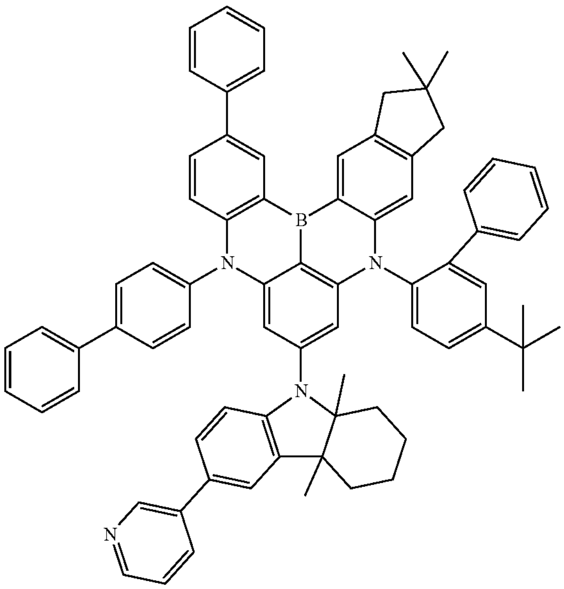
-continued
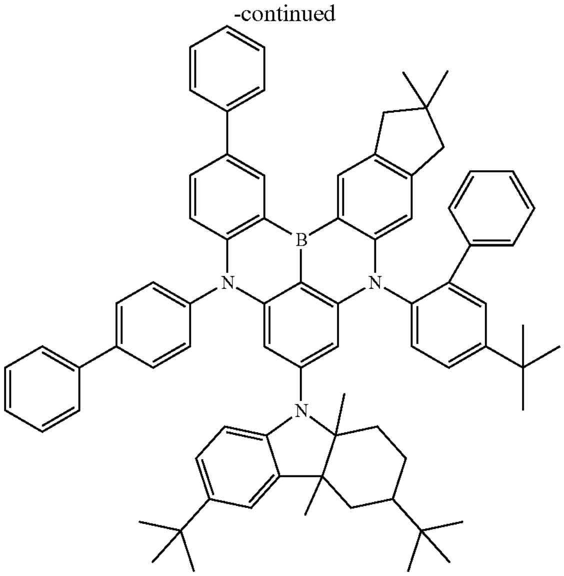
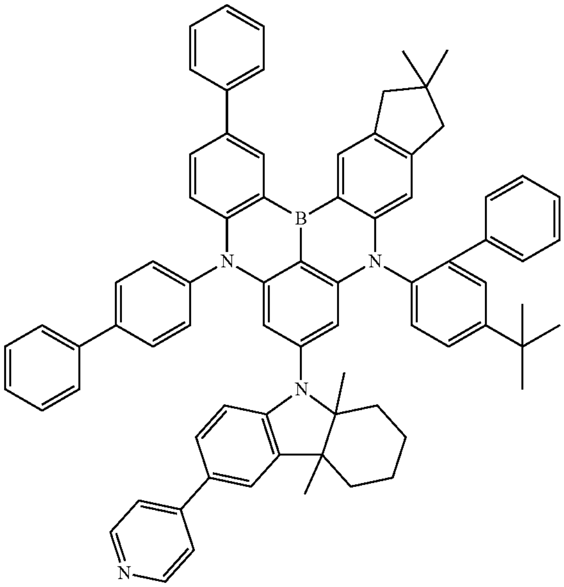
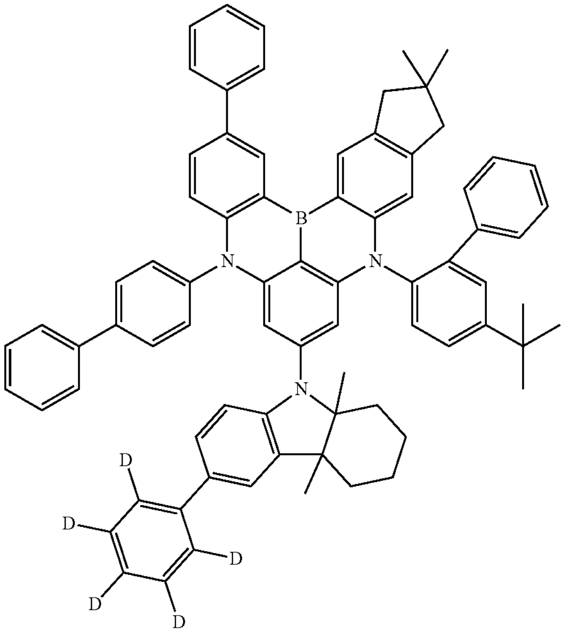
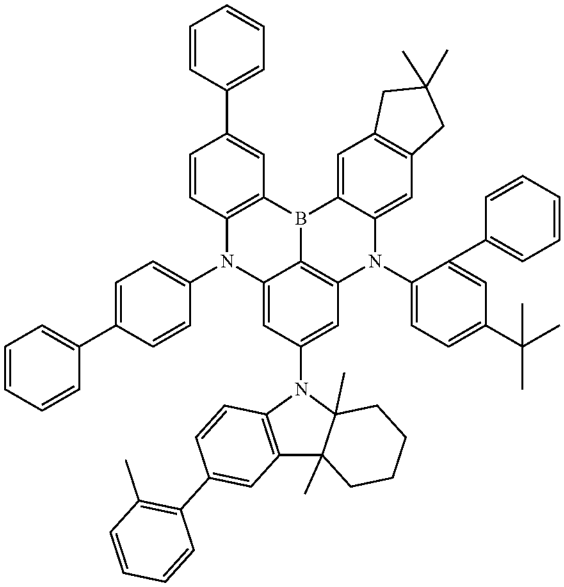

-continued
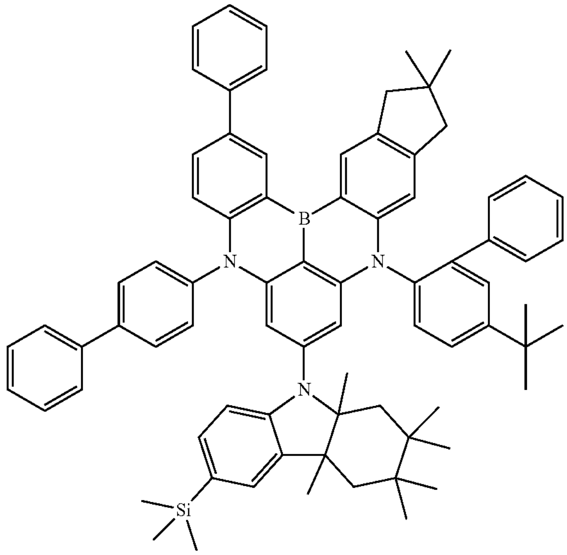
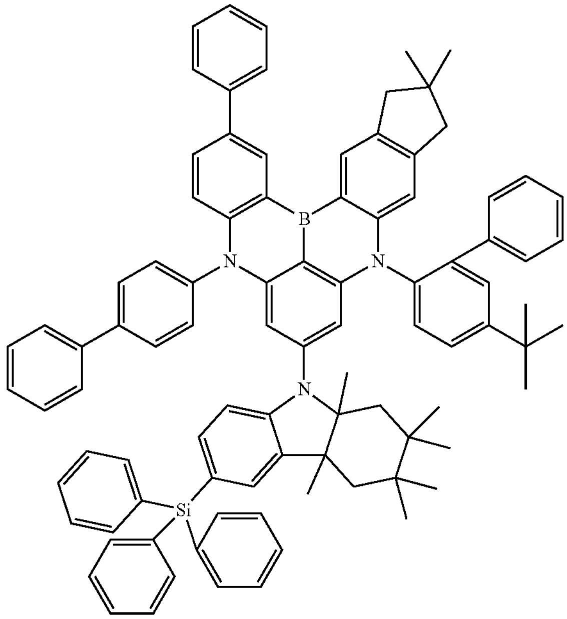
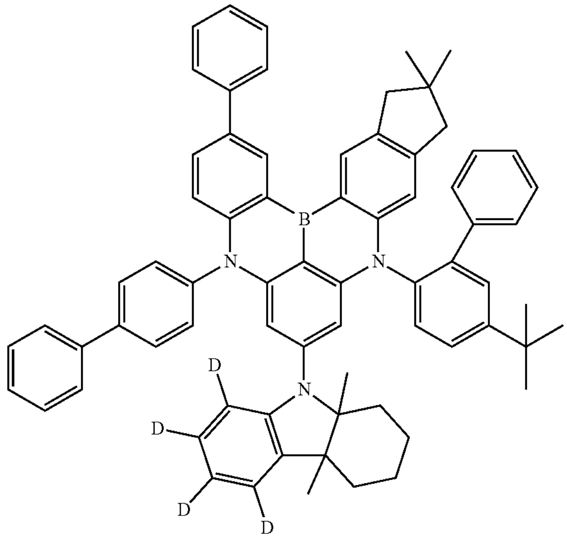
-continued
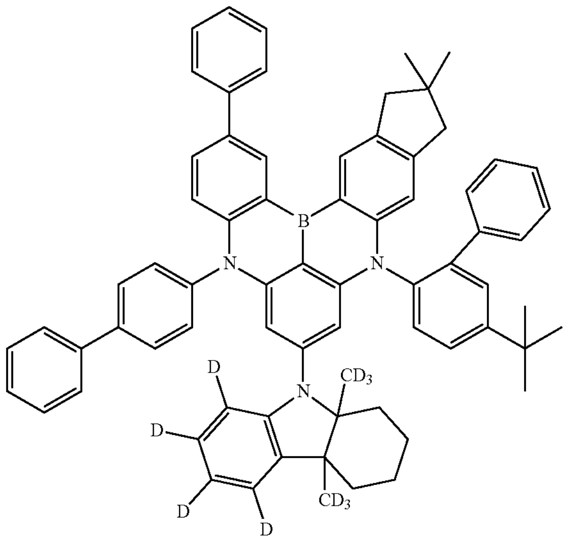
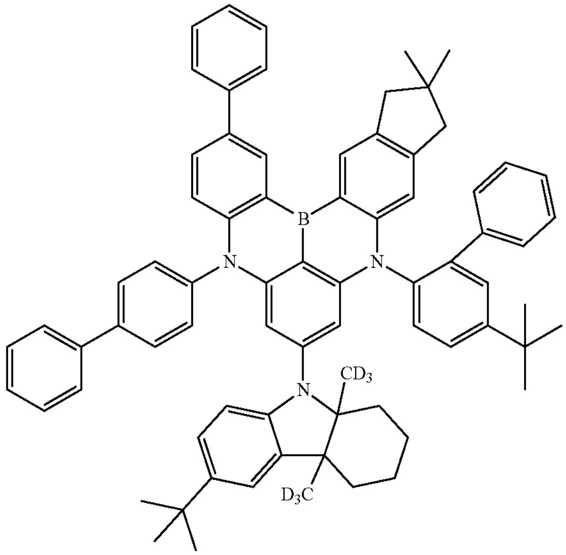
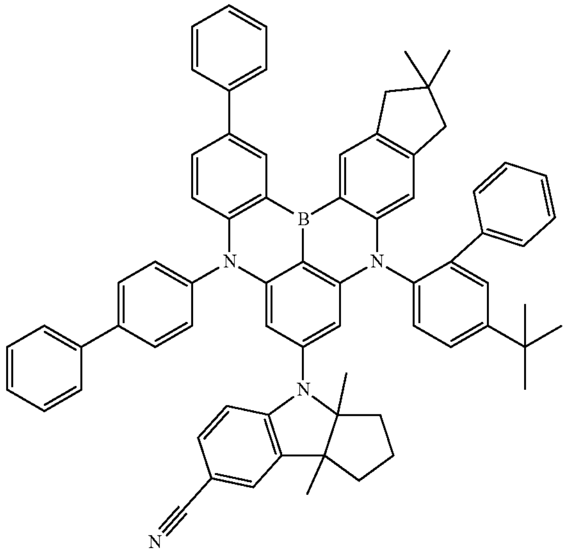

-continued
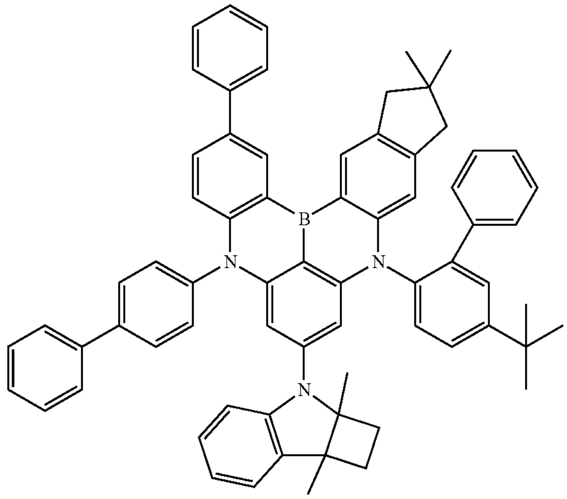
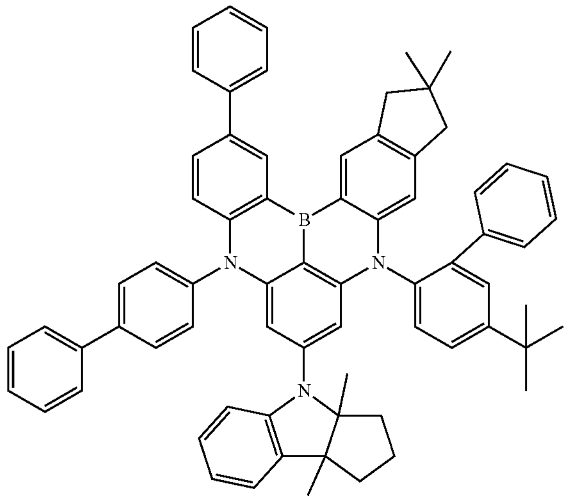
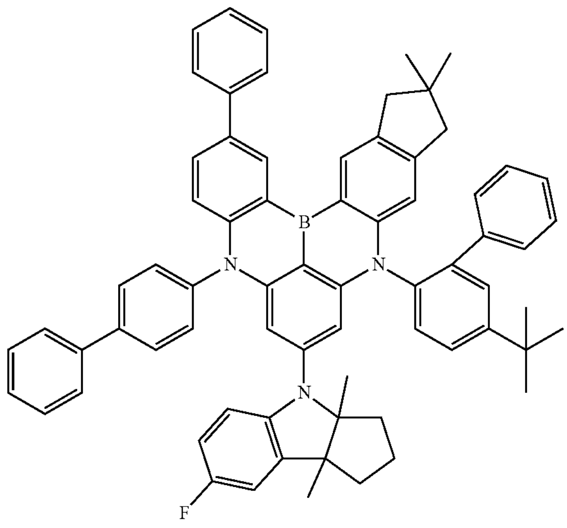
-continued
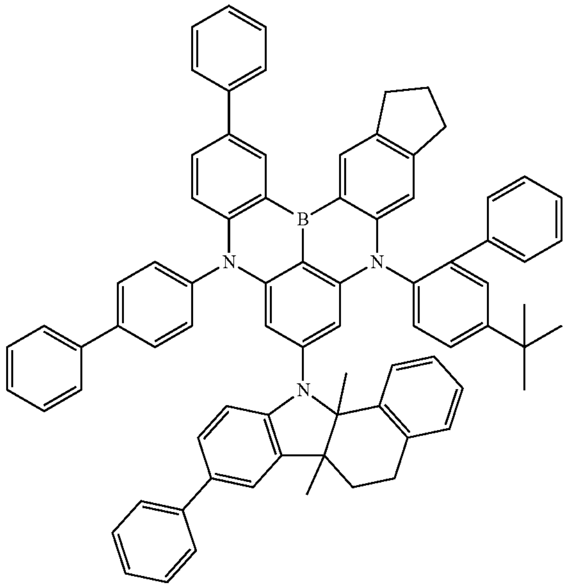
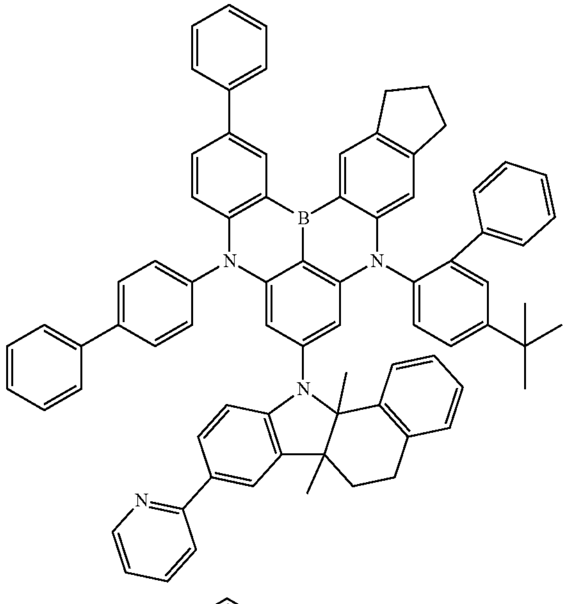
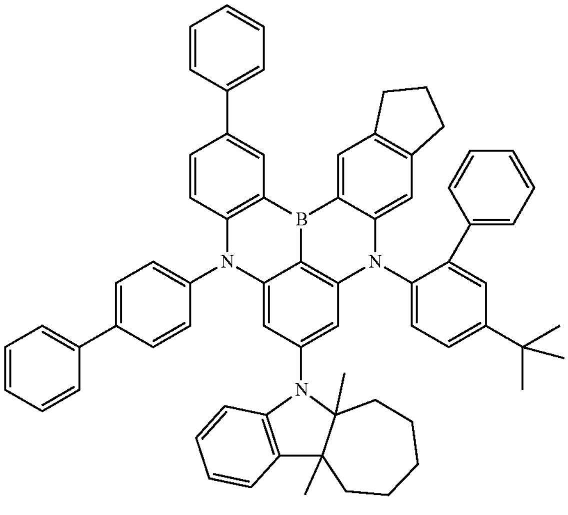

-continued
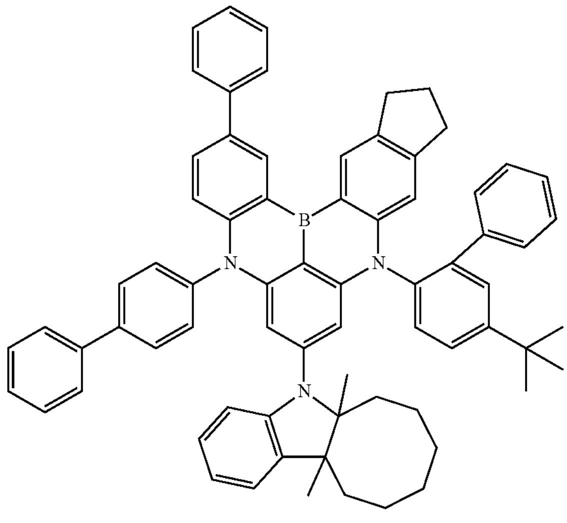
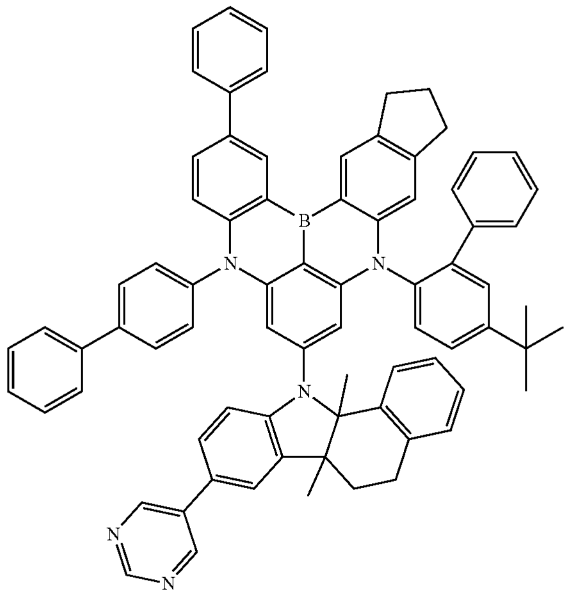
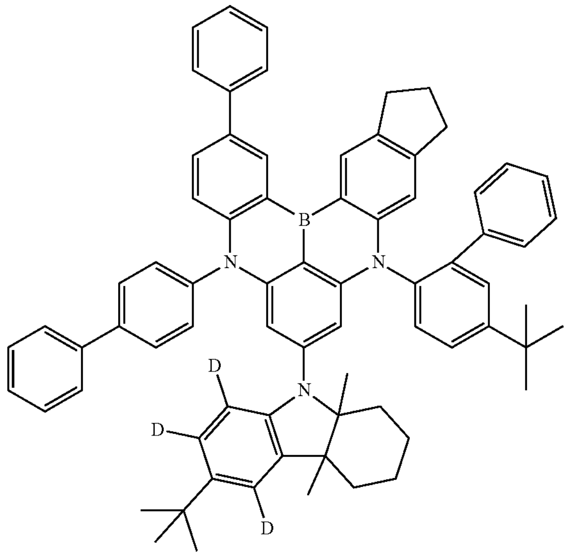
-continued
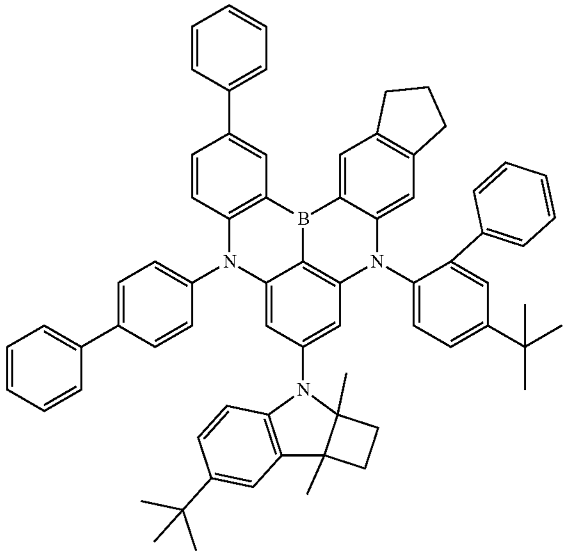
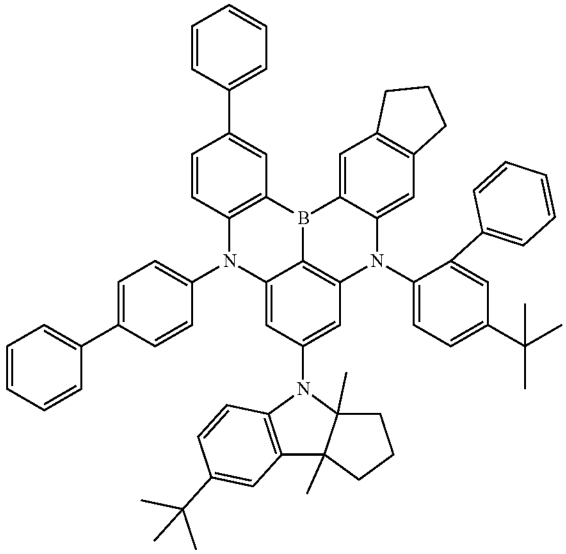
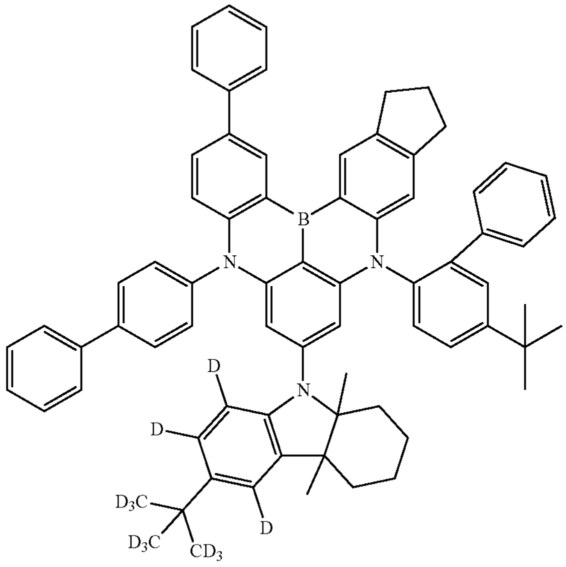

-continued
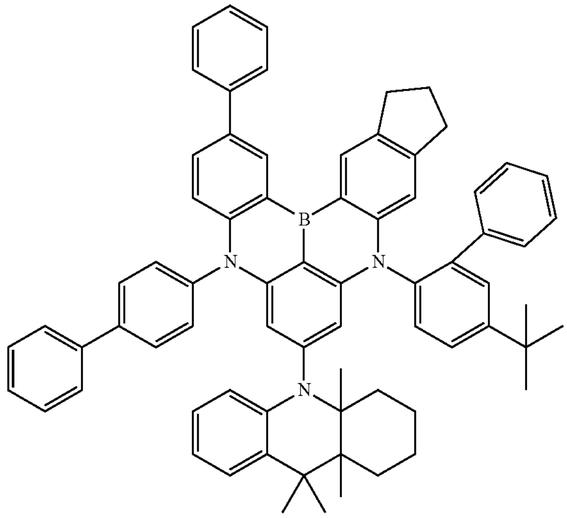
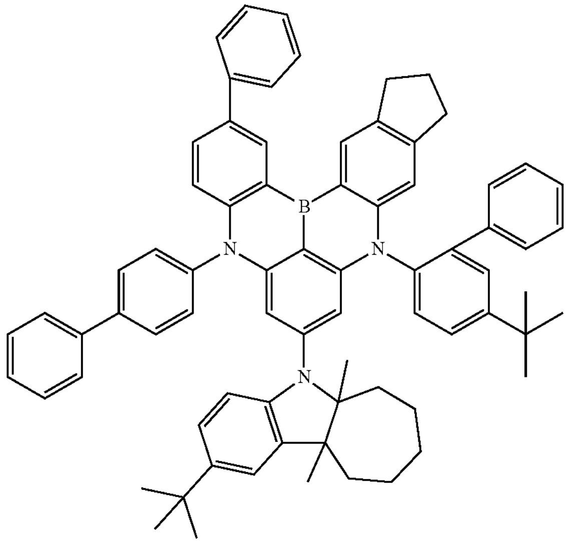
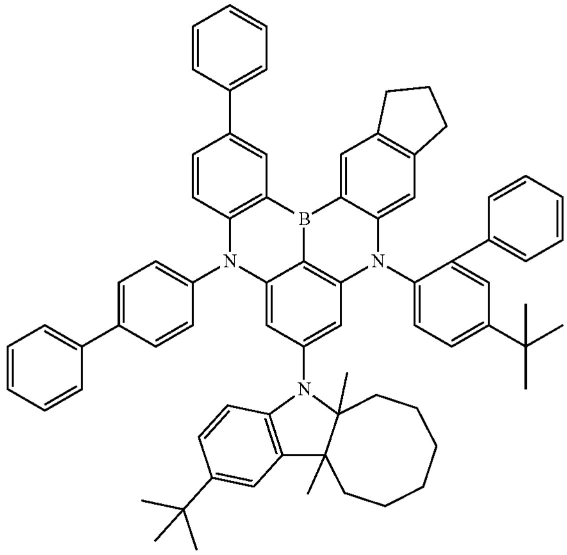
-continued
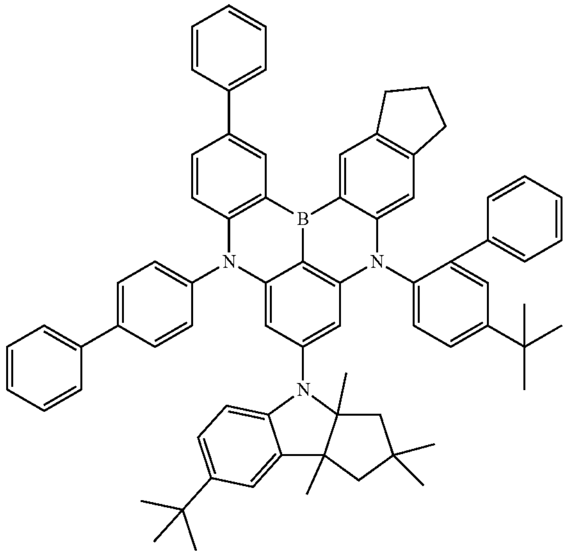
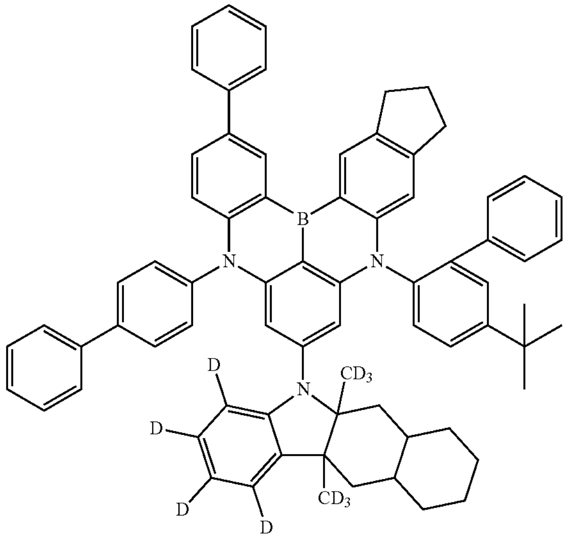
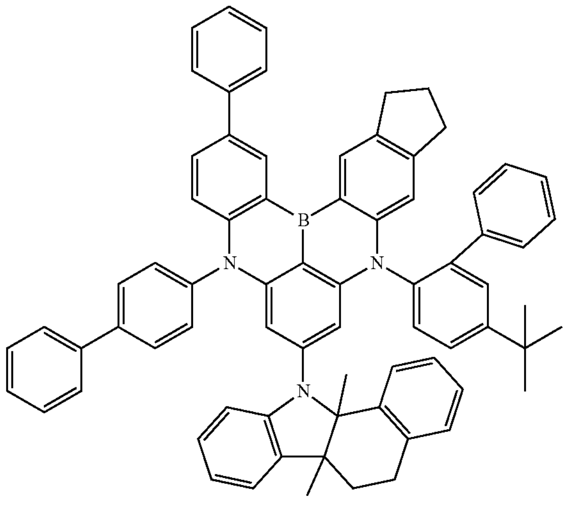

-continued
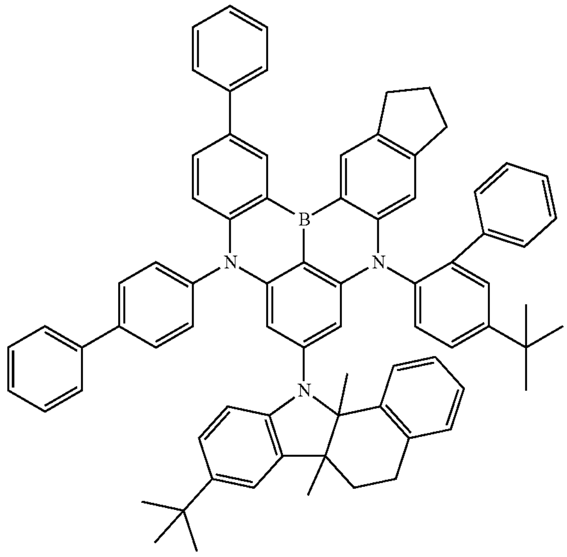
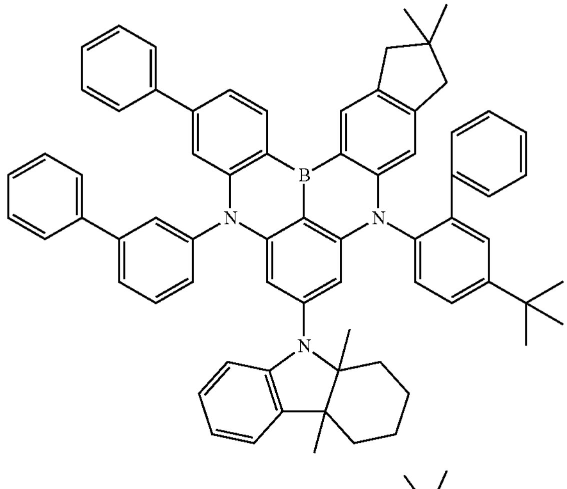
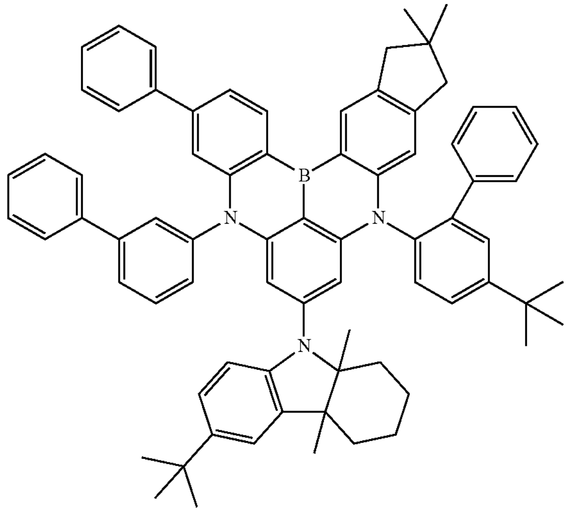
-continued
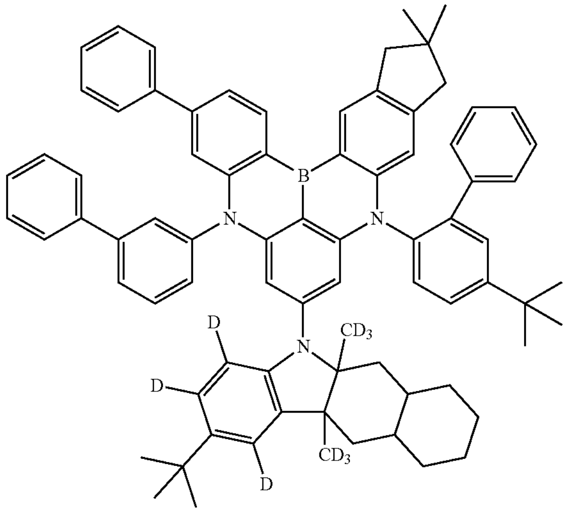
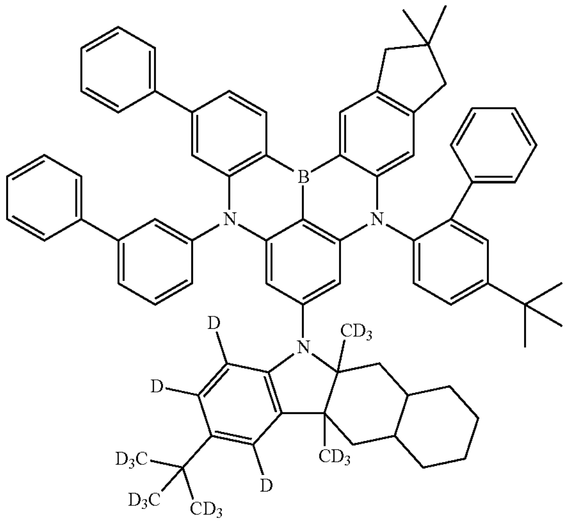
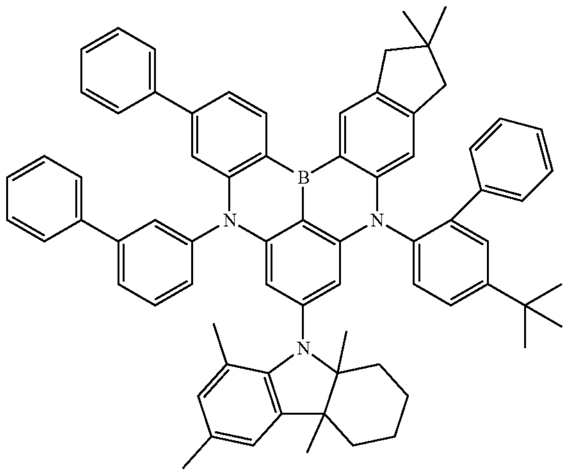

-continued
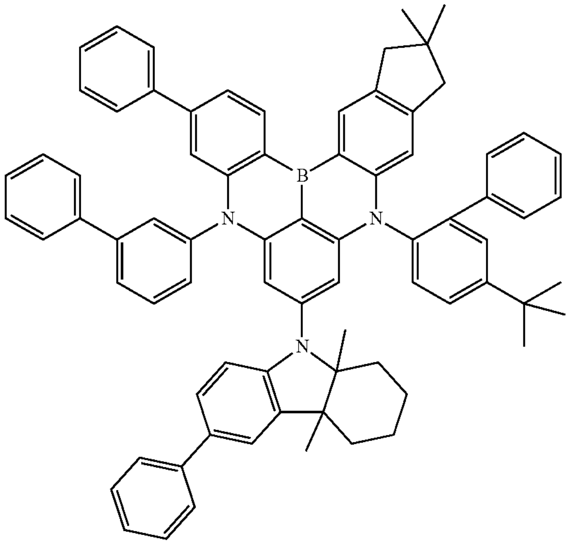
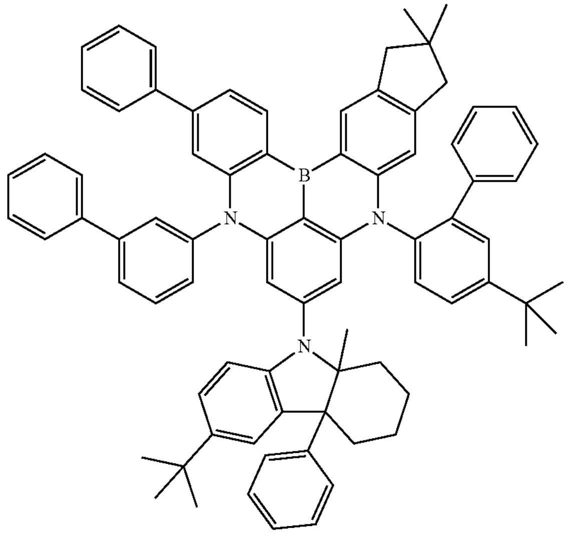
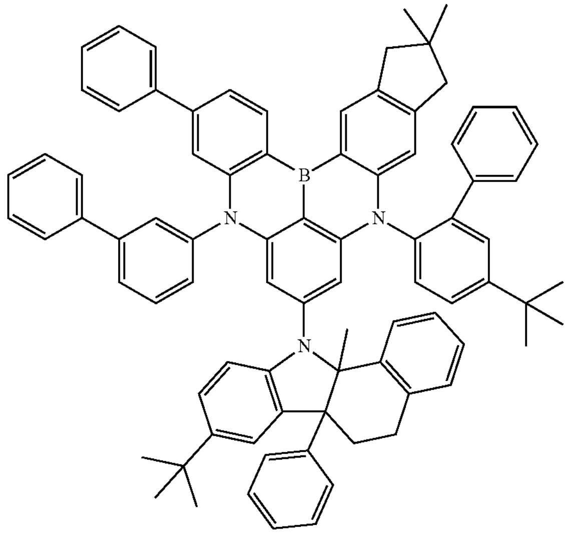
-continued
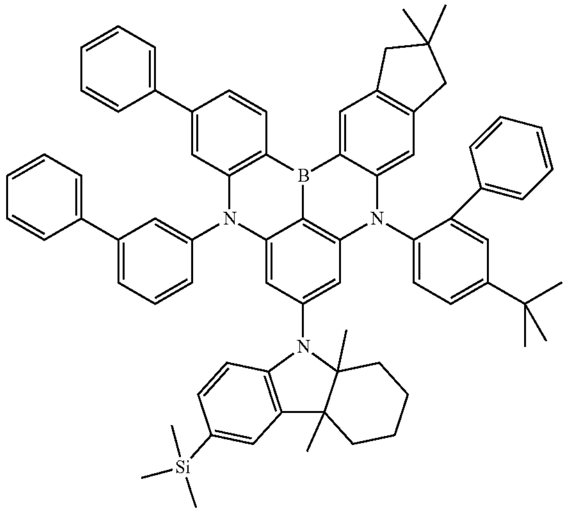
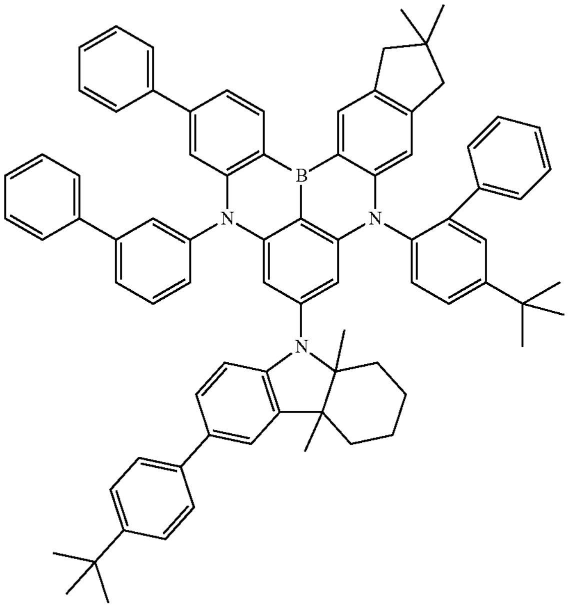
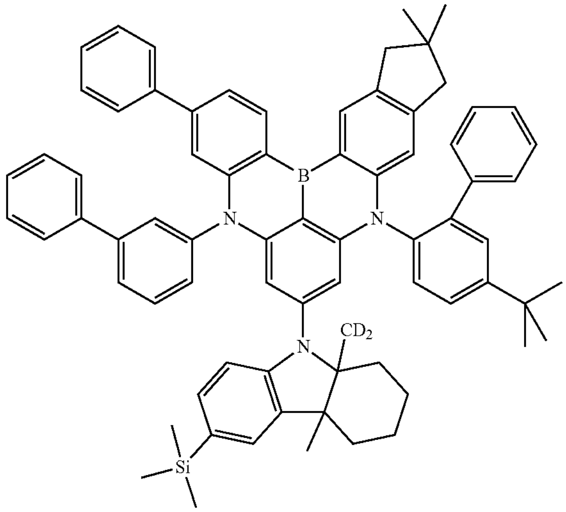

-continued
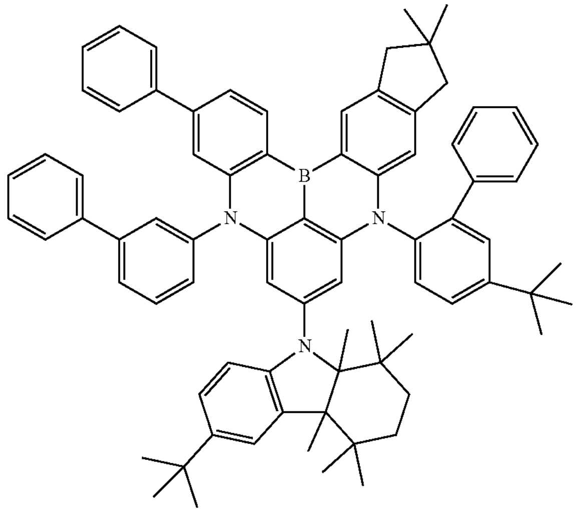
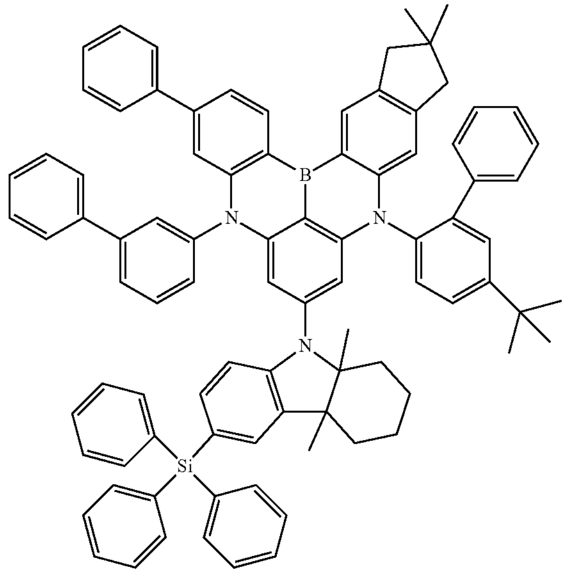
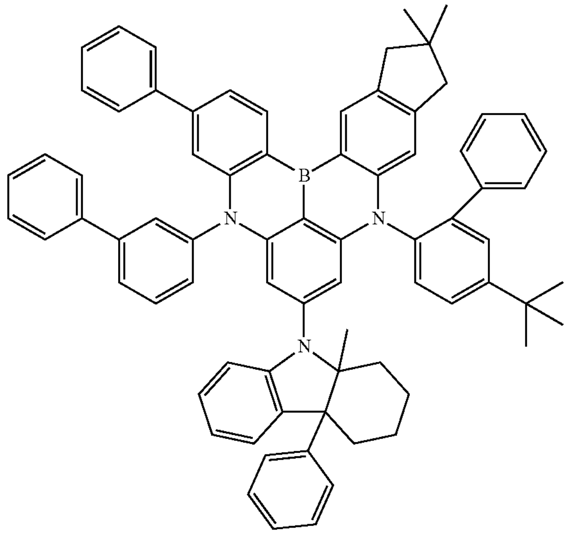
-continued
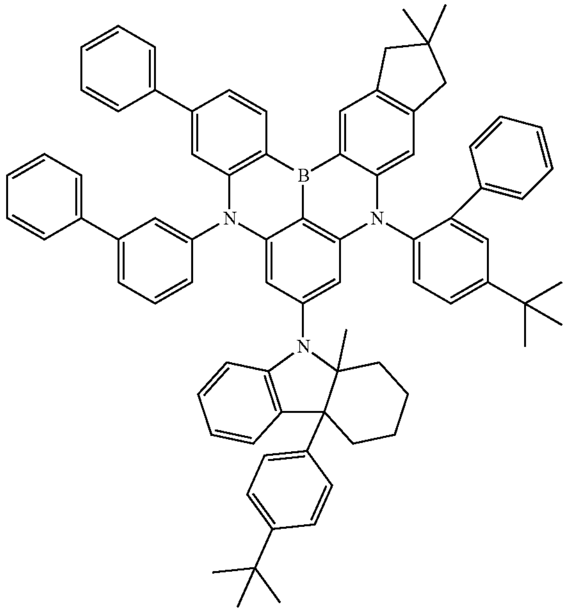
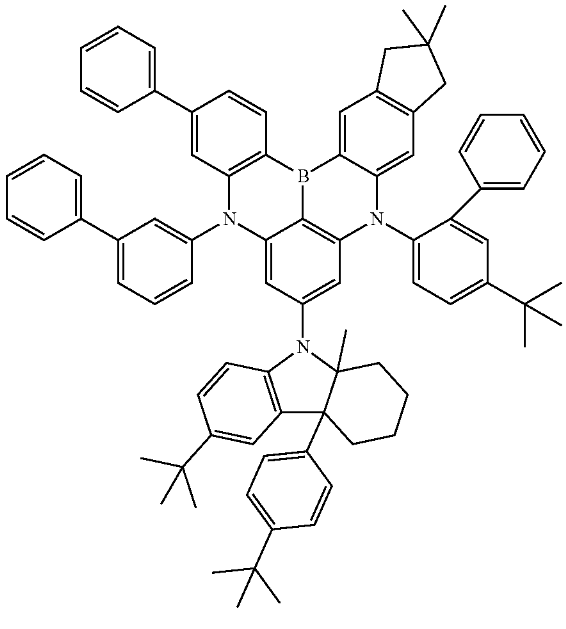

-continued
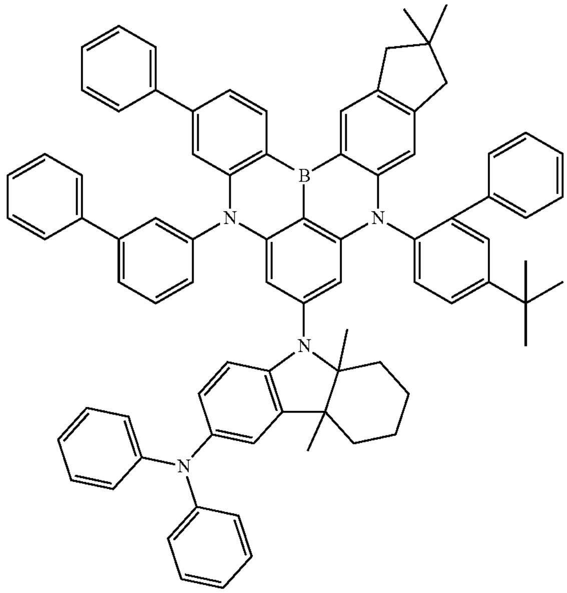
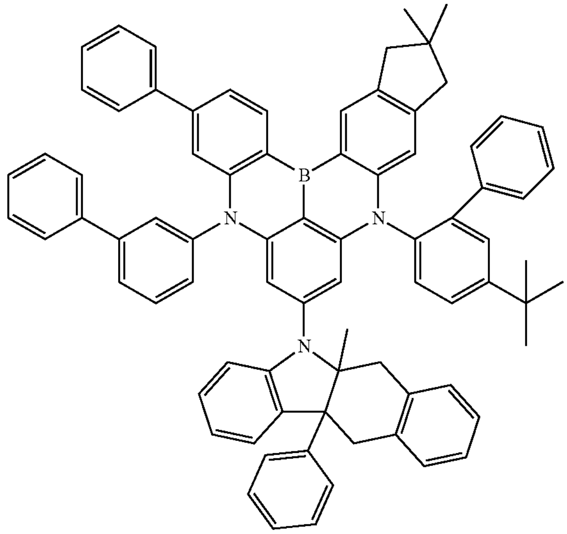
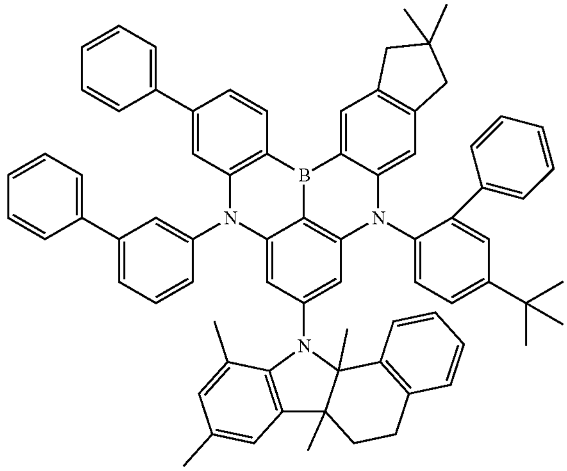
-continued
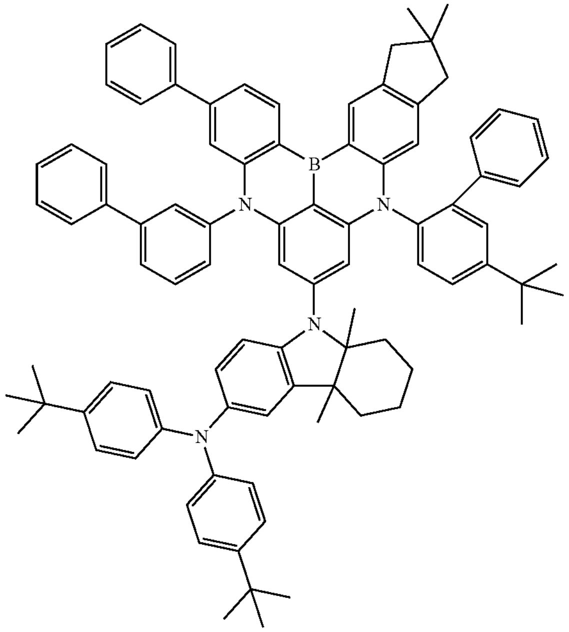
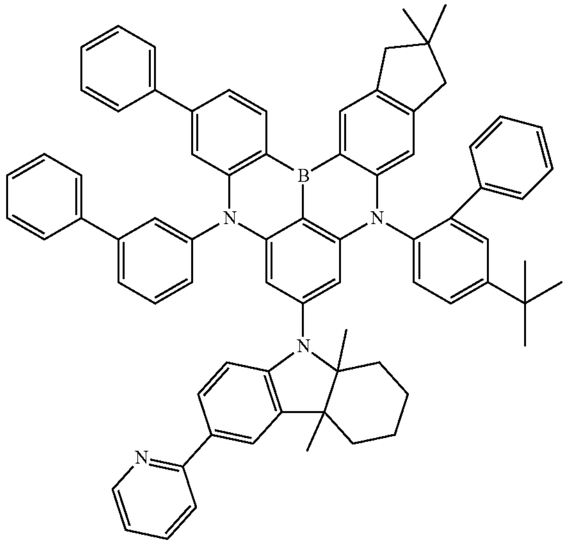
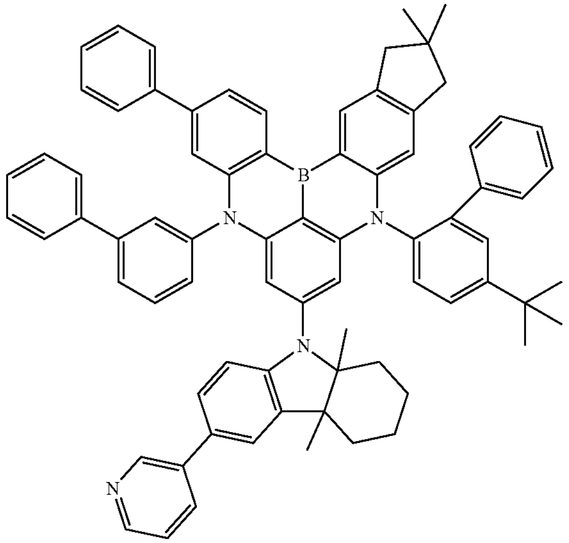

-continued
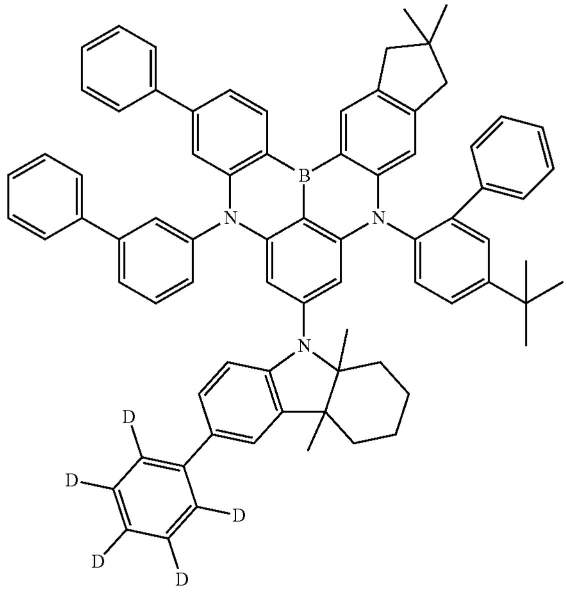
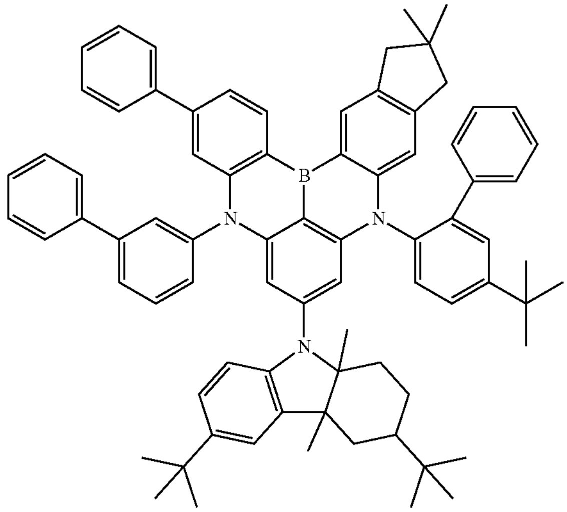
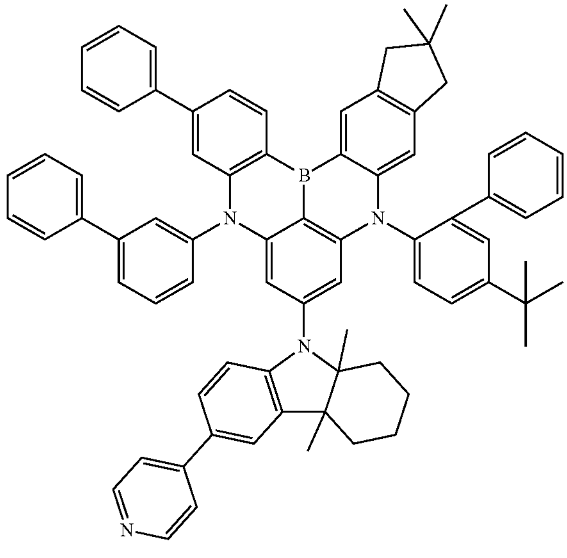
-continued
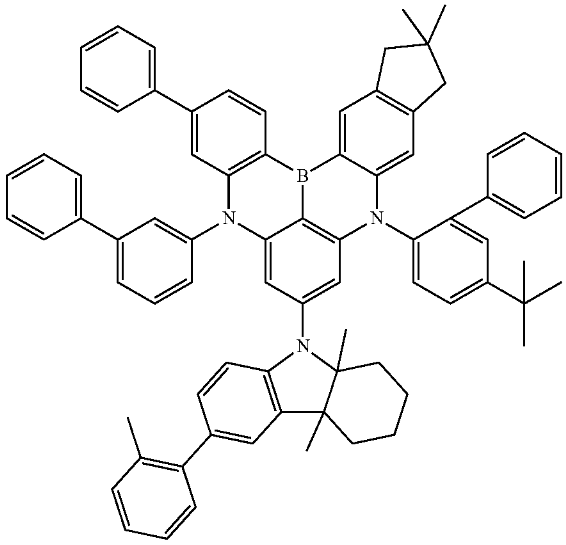
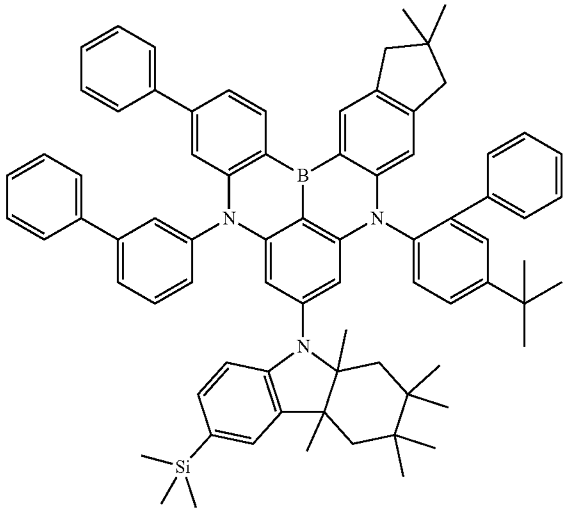
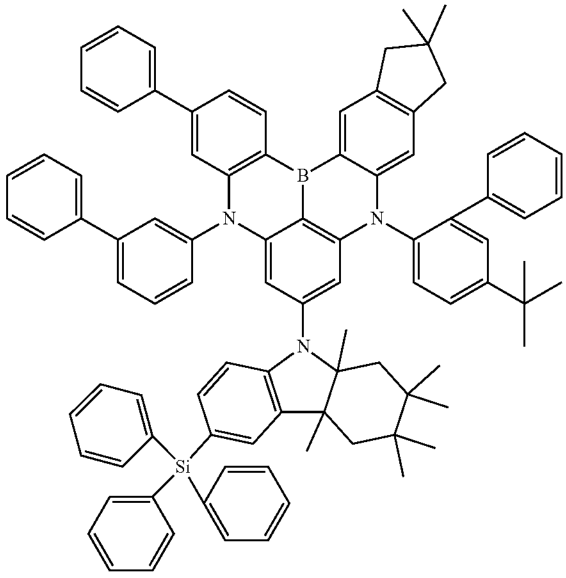

-continued
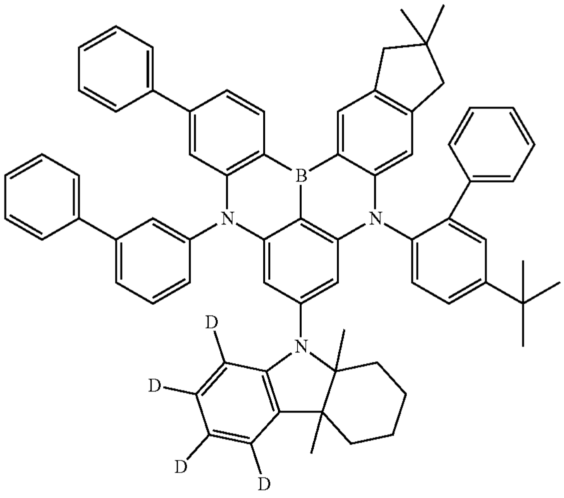
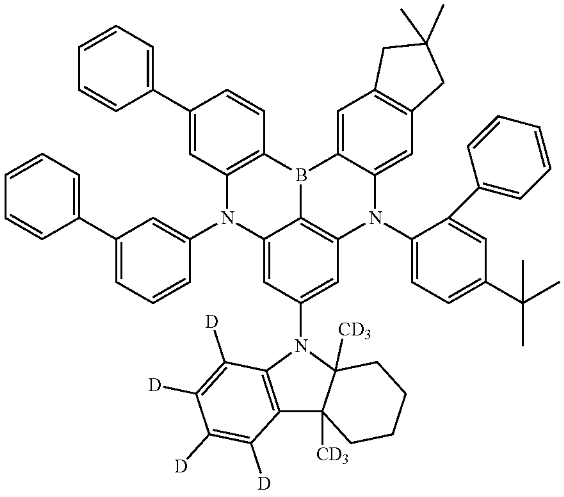
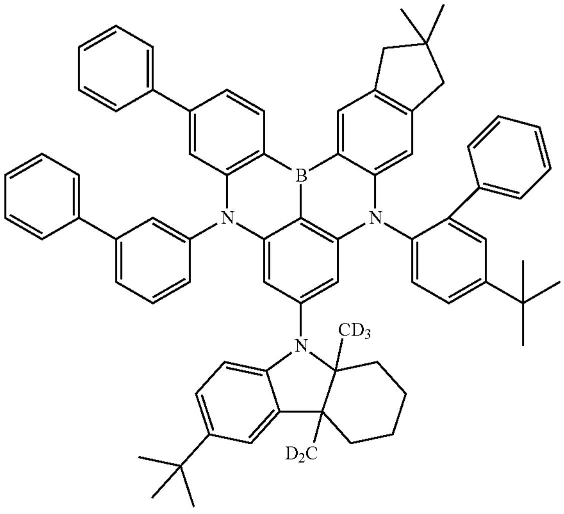
-continued
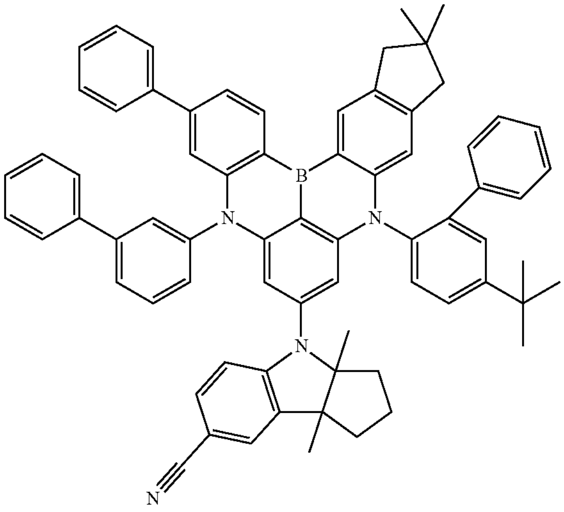
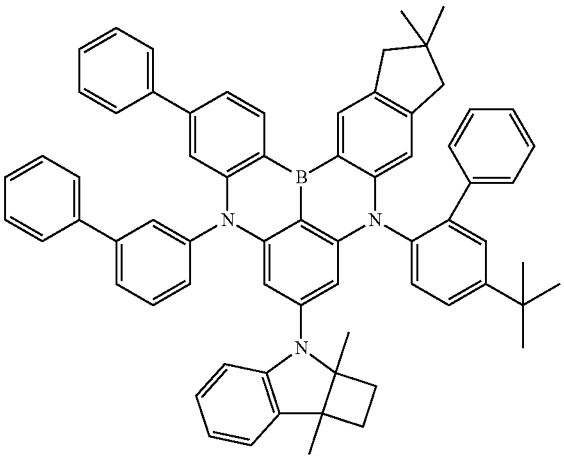
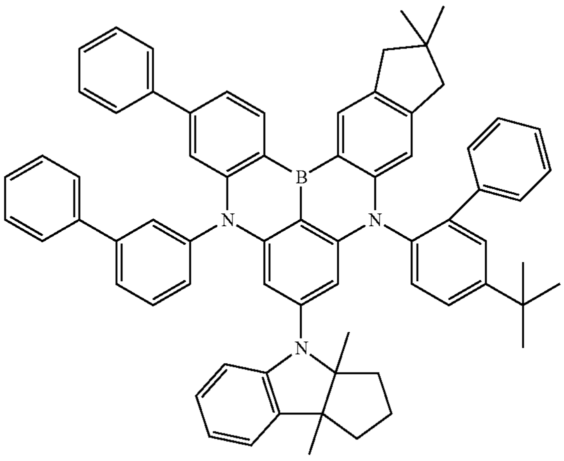

-continued
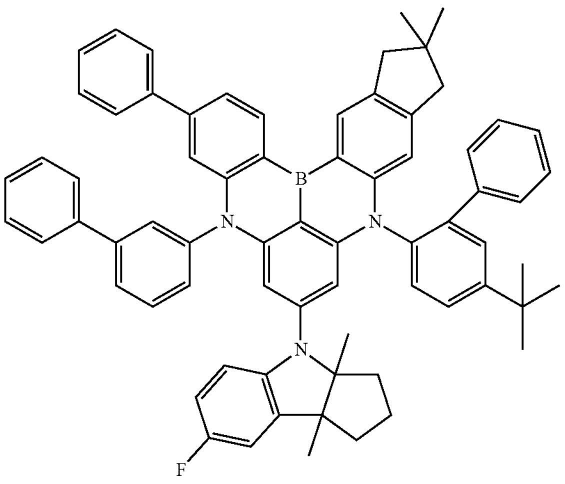
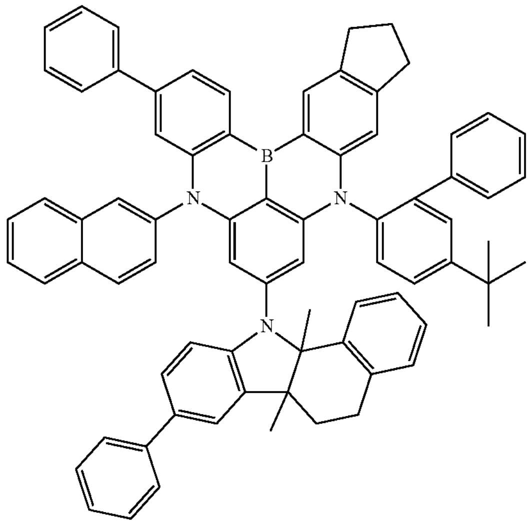
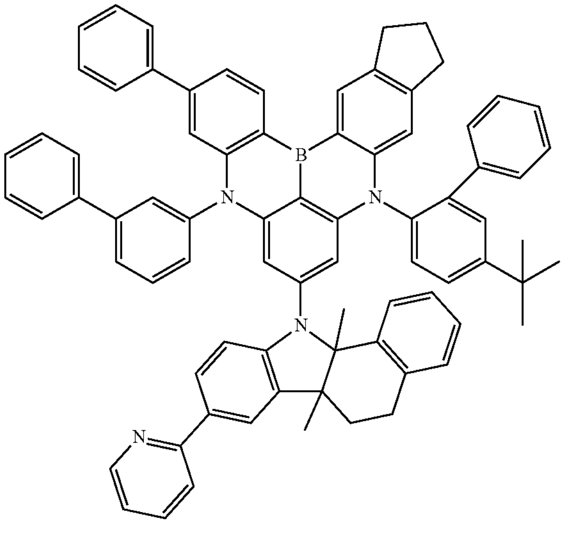
-continued
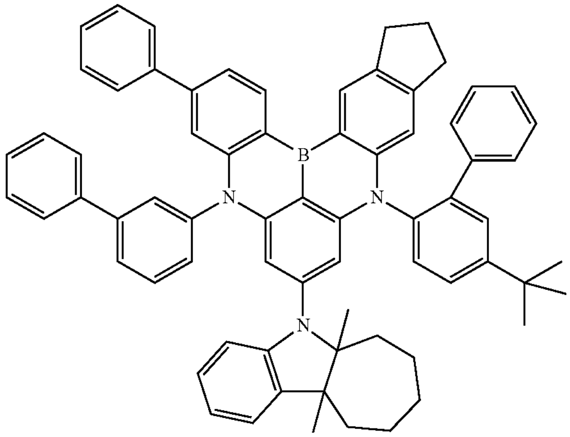
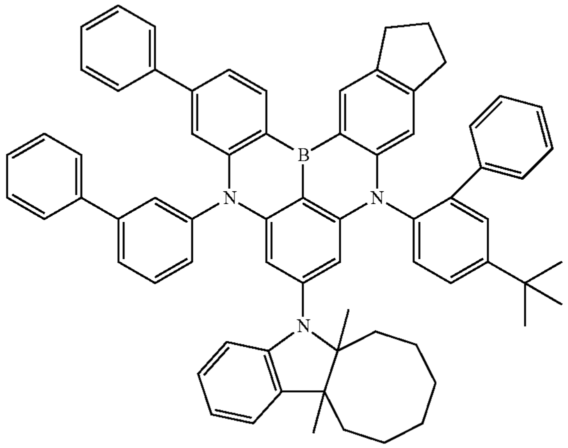
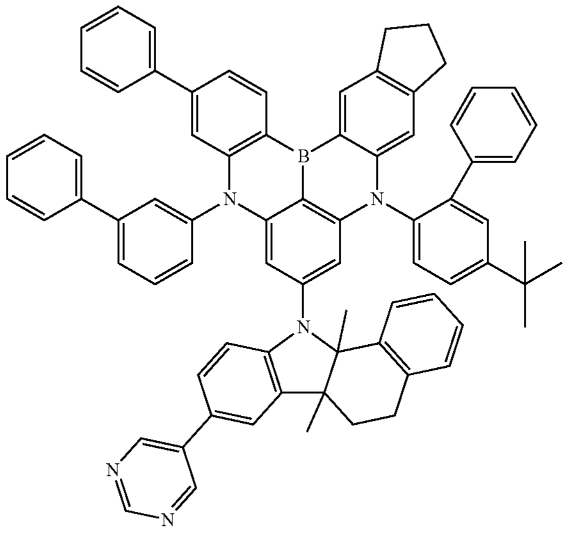

-continued
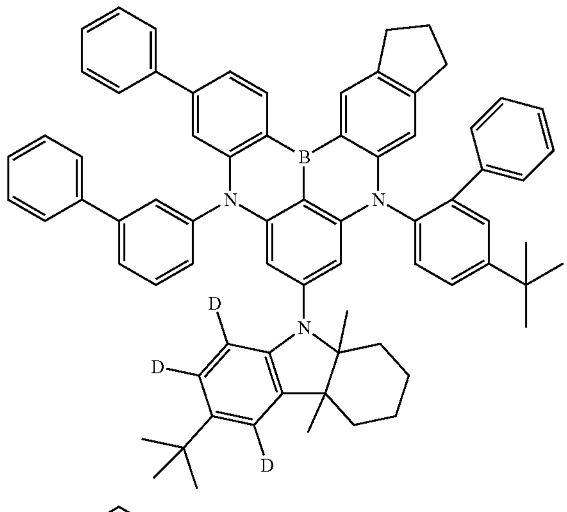
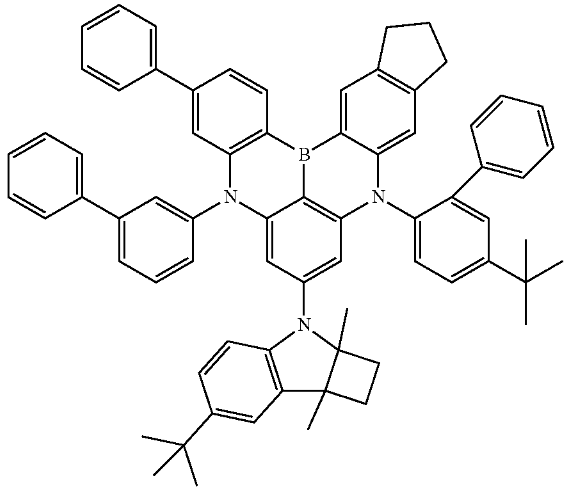
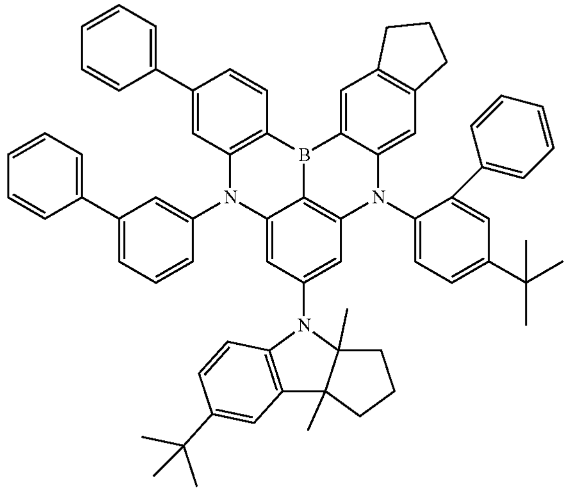
-continued
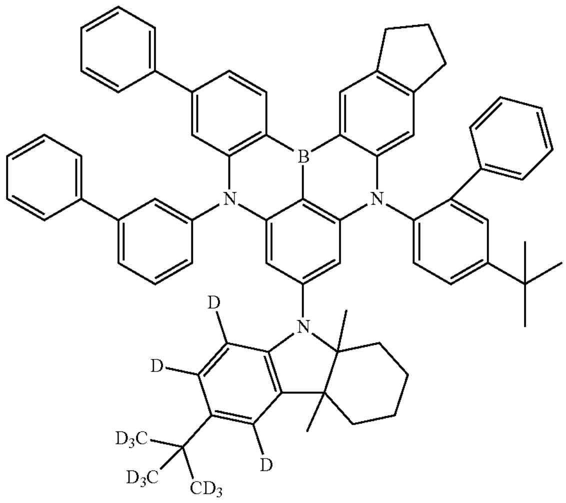
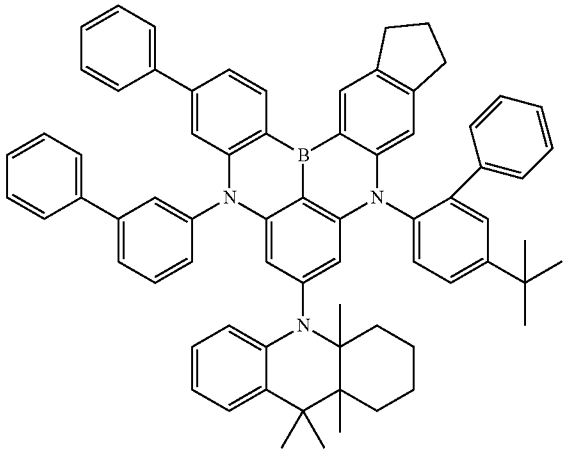
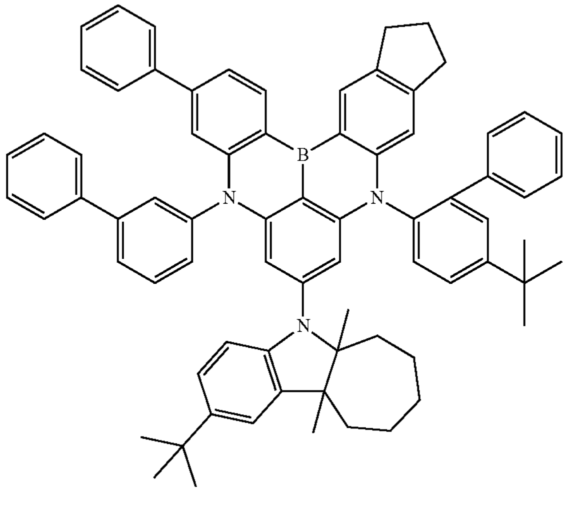

-continued
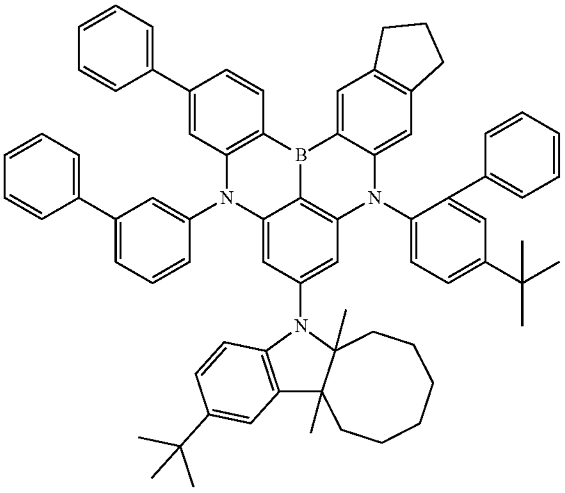
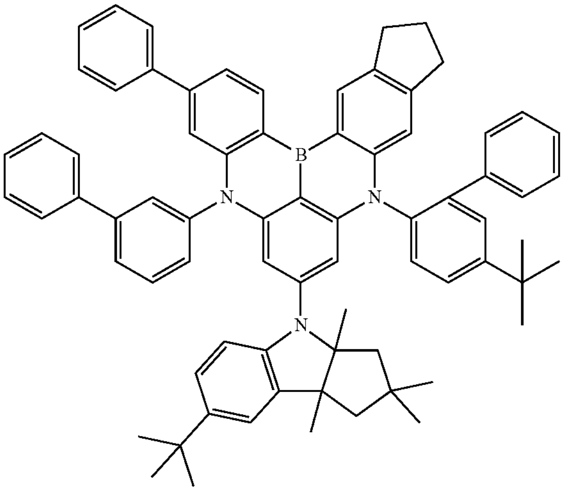
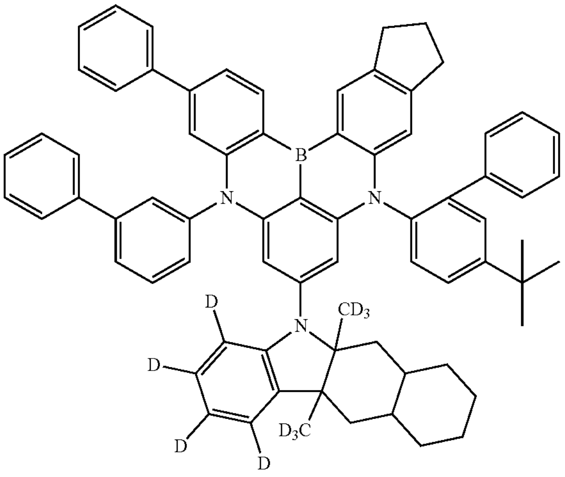
-continued
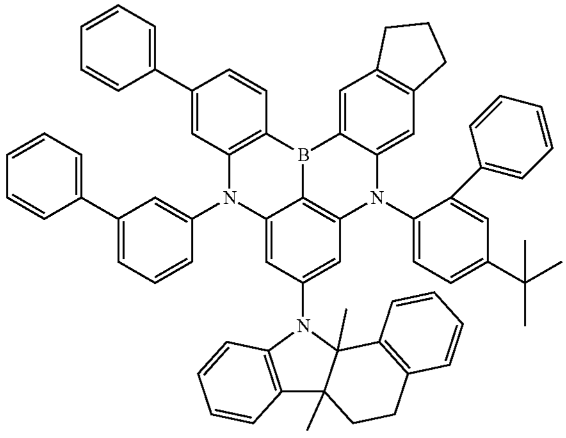
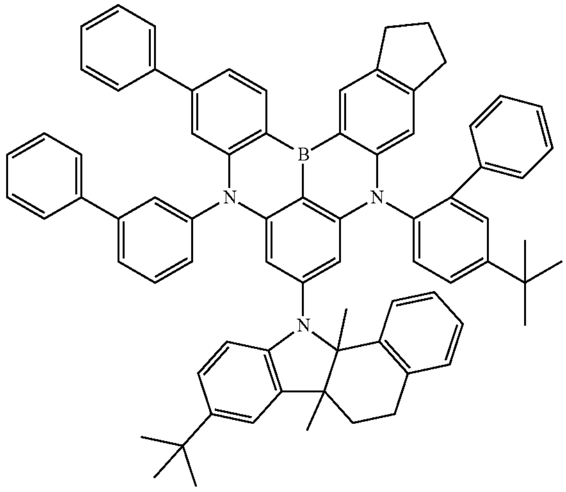
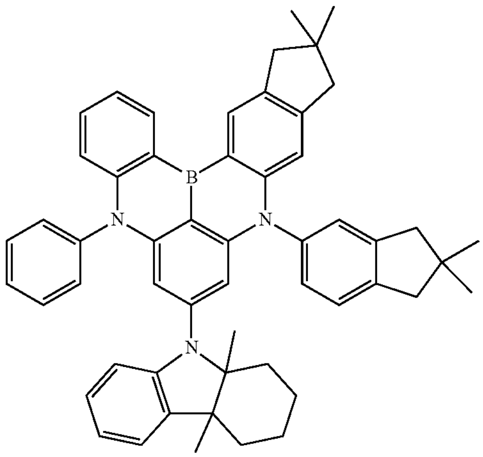

-continued
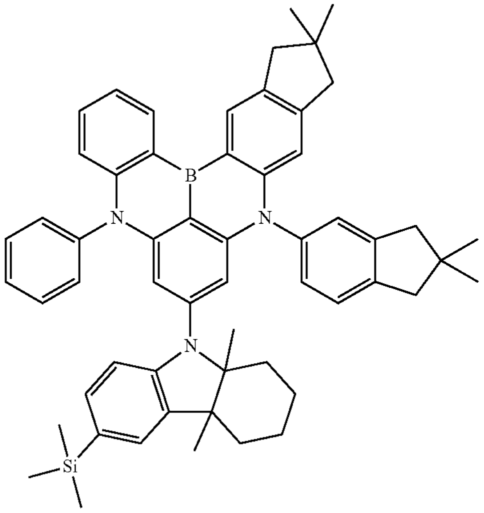
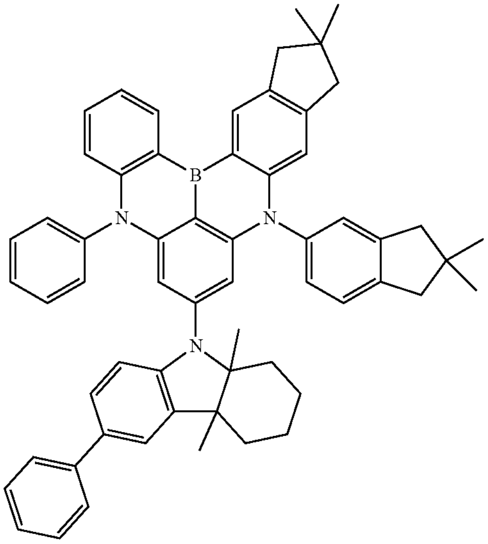
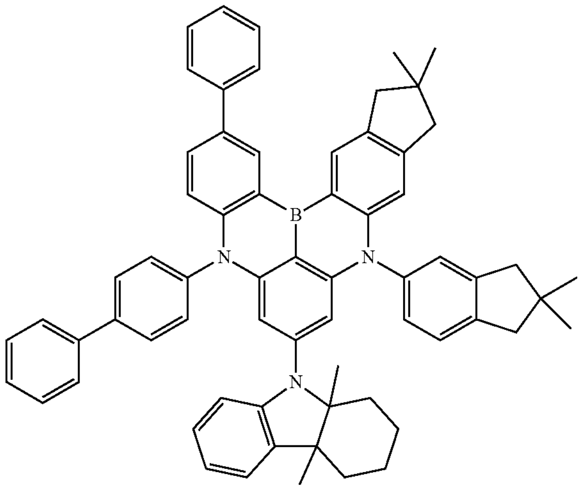
-continued
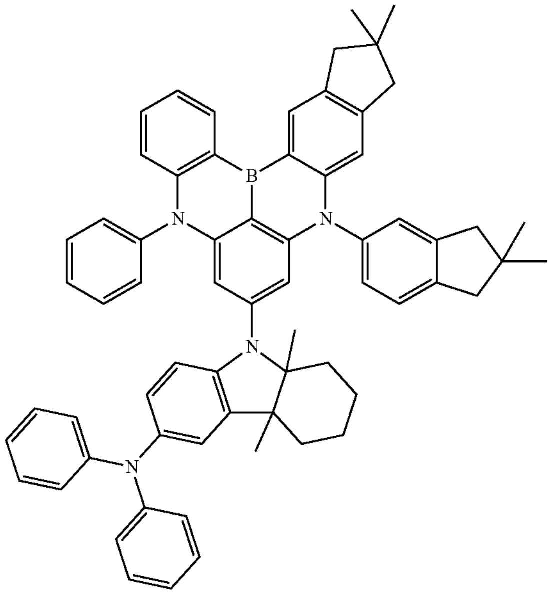
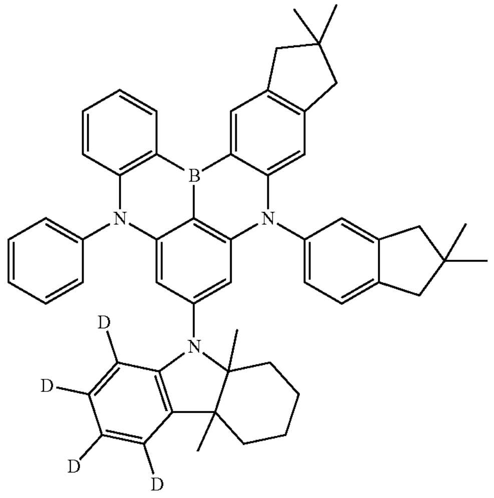
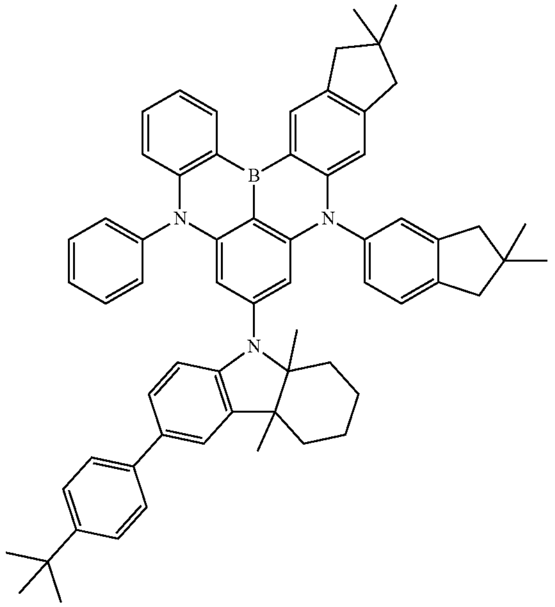

-continued
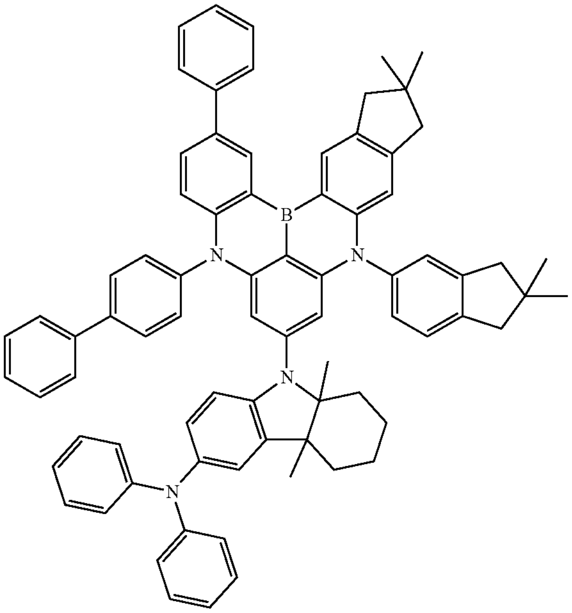
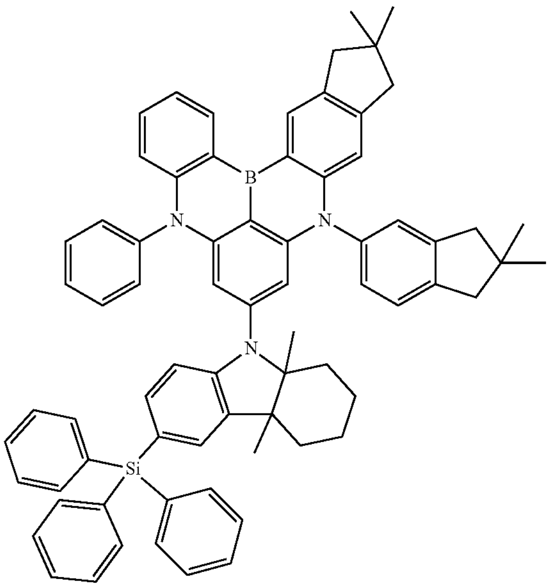
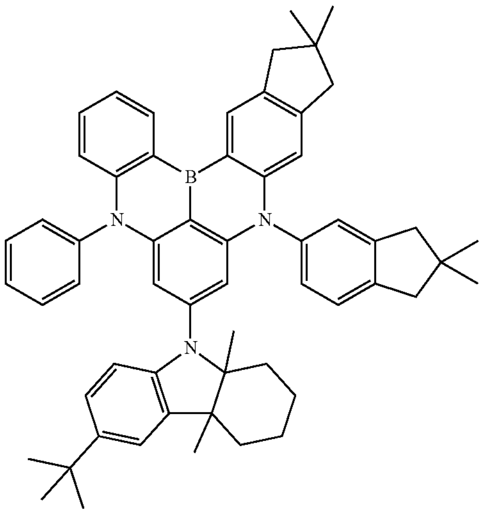
-continued
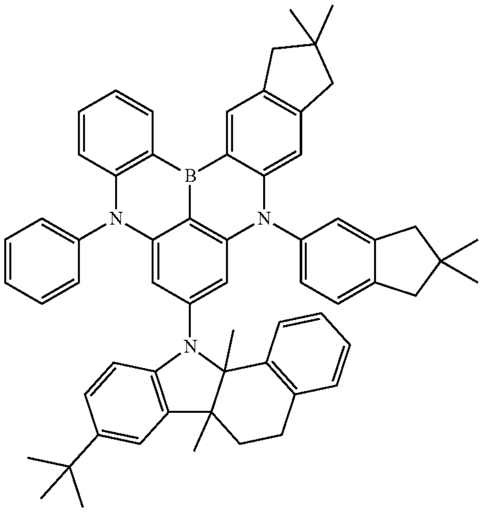
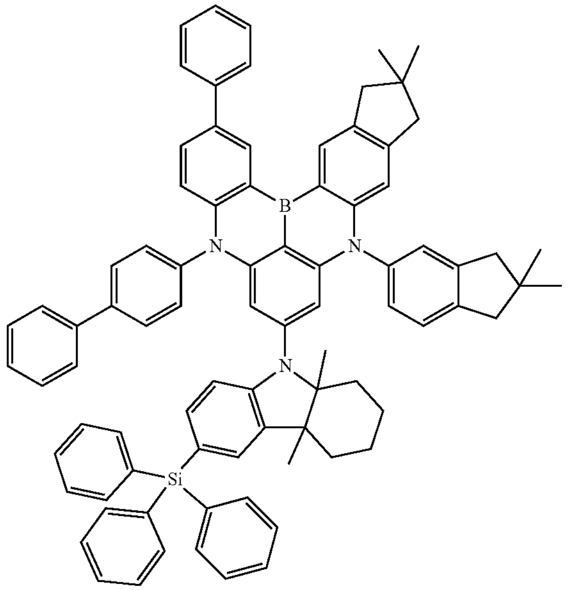
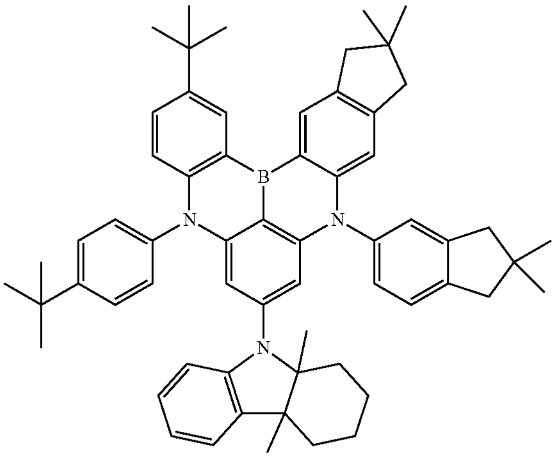

-continued
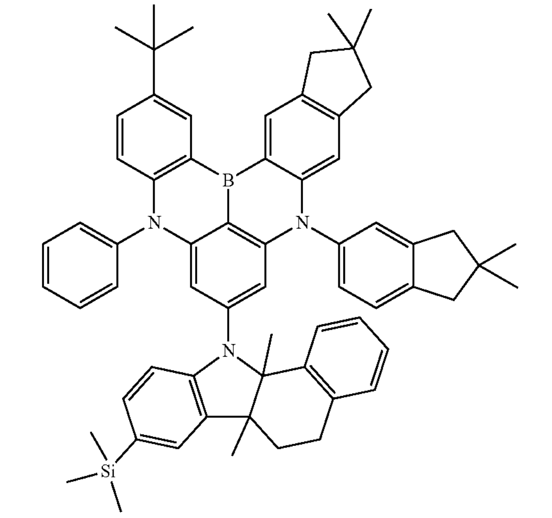
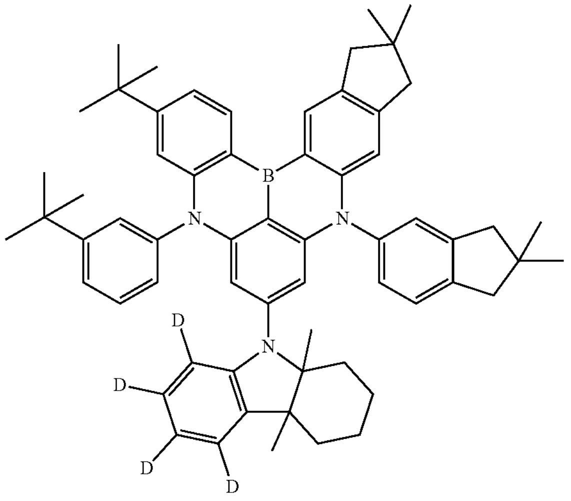
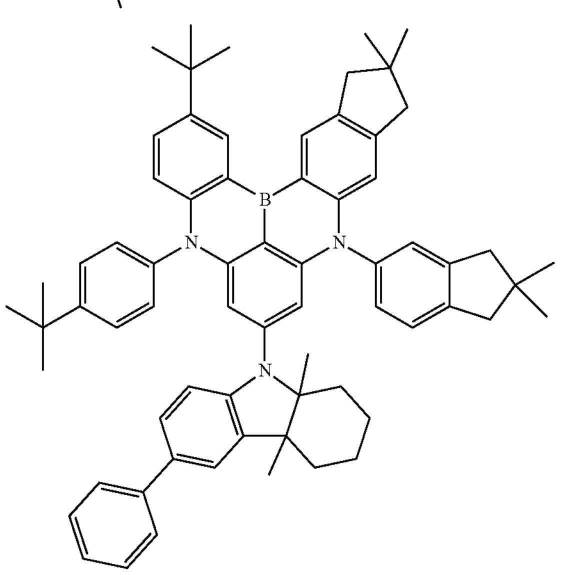
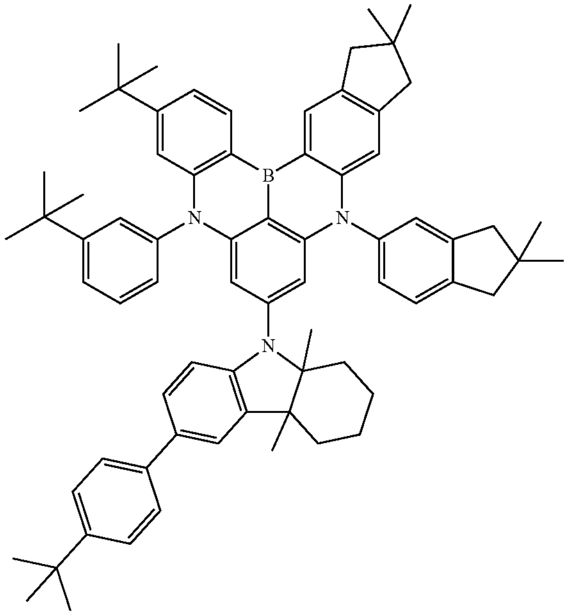
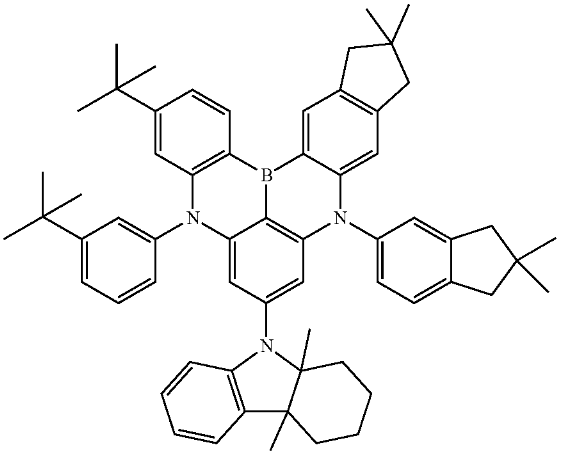
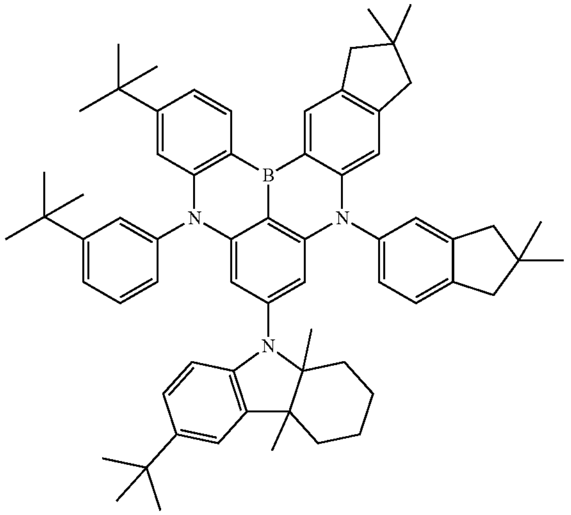
-continued -continued
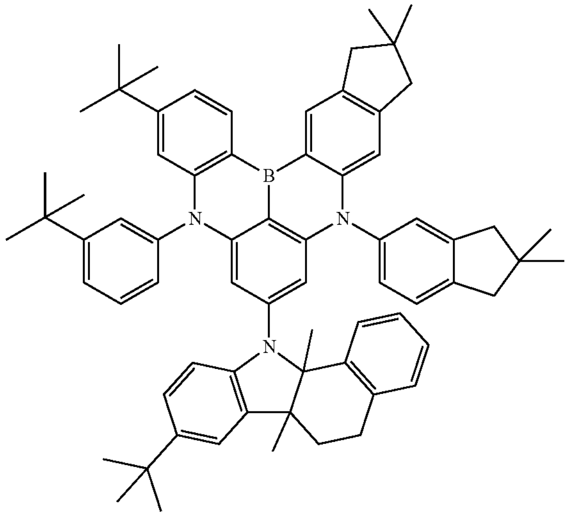
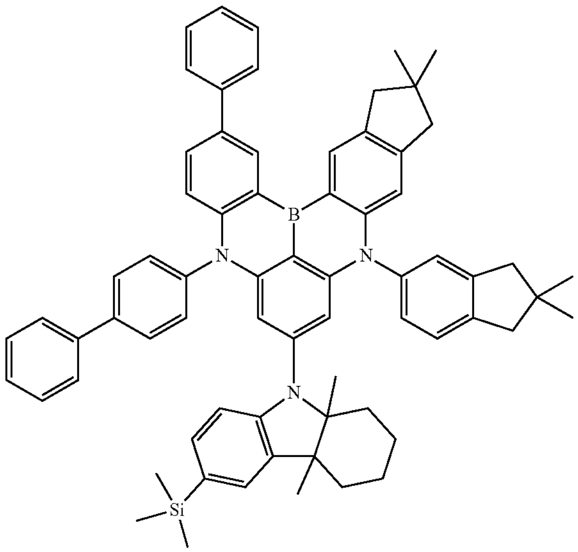
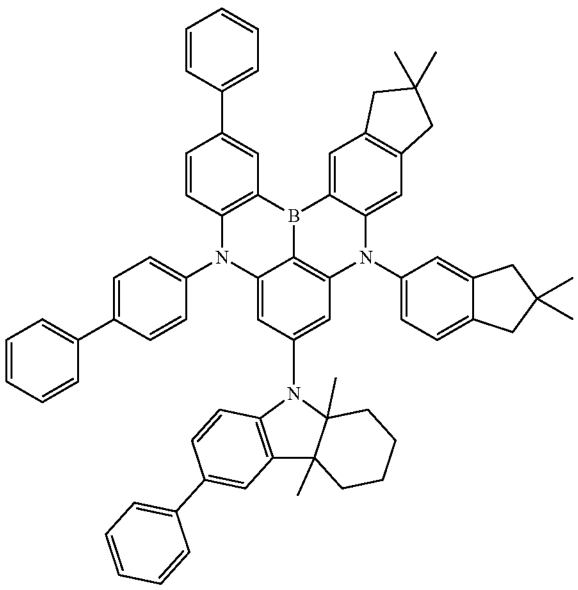
-continued
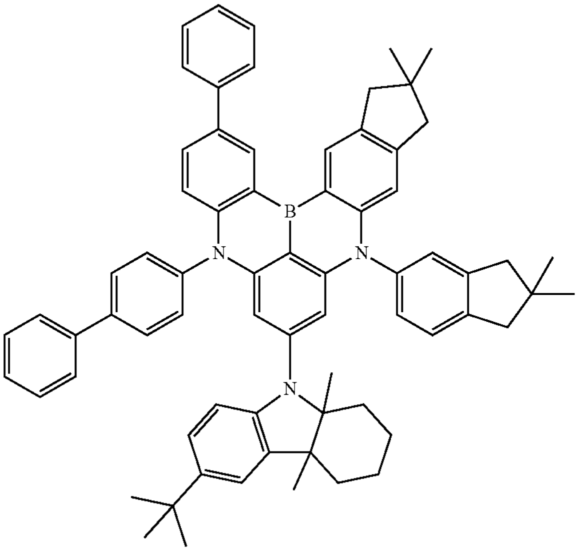
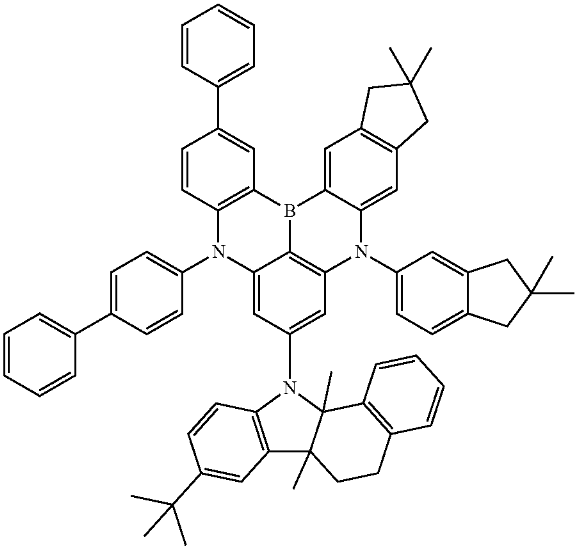
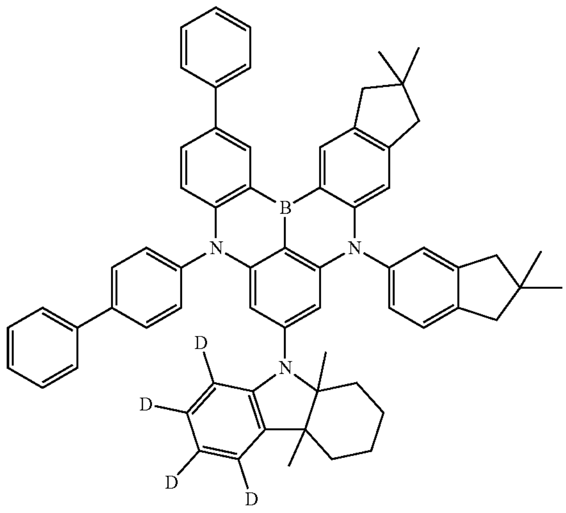

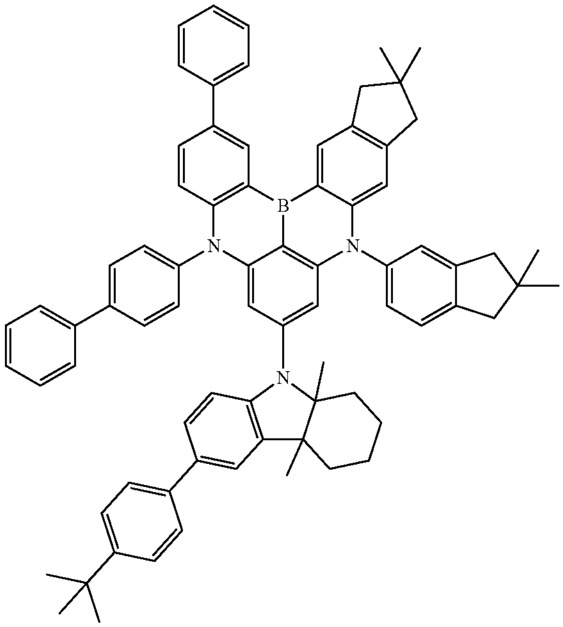
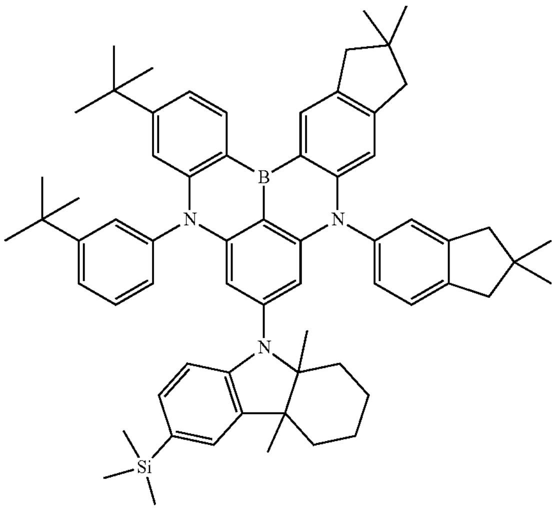
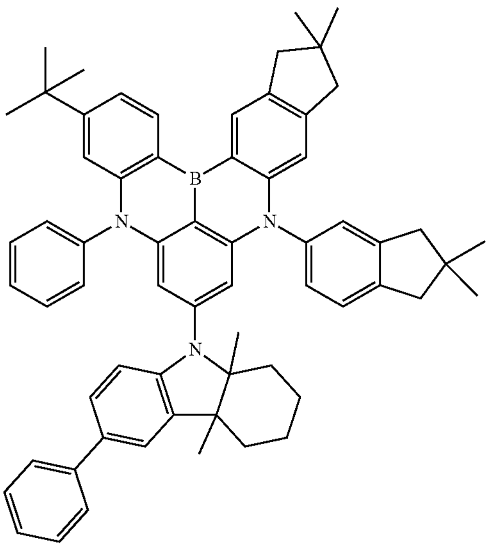
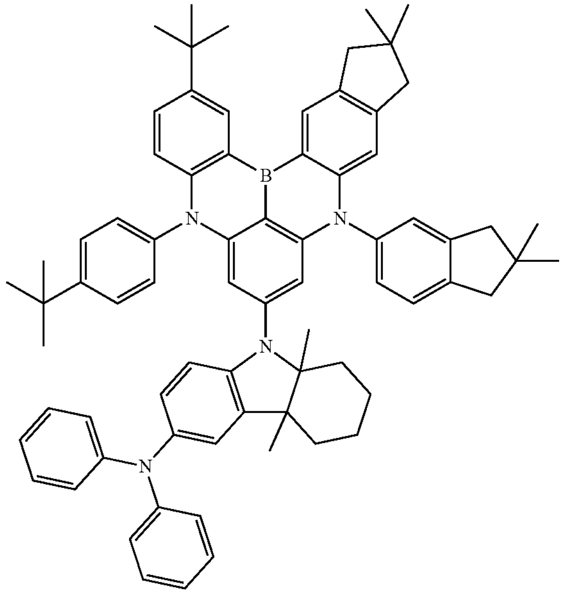
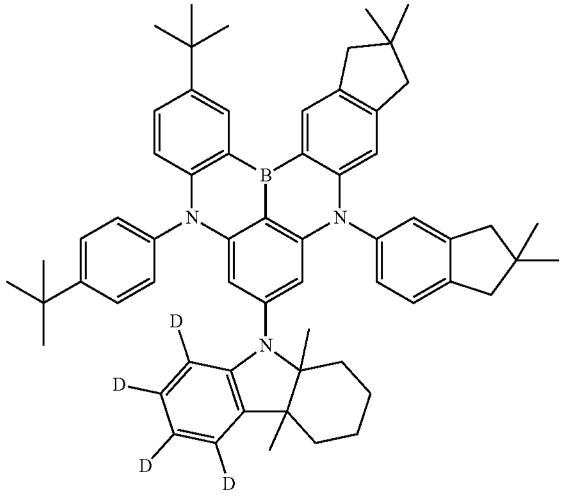
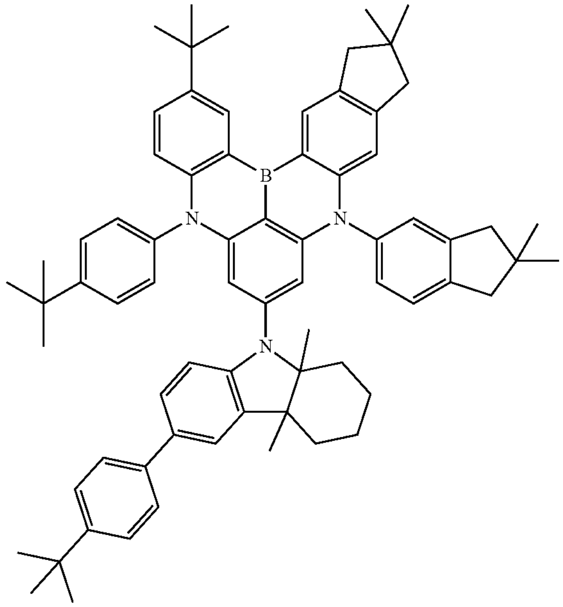

-continued
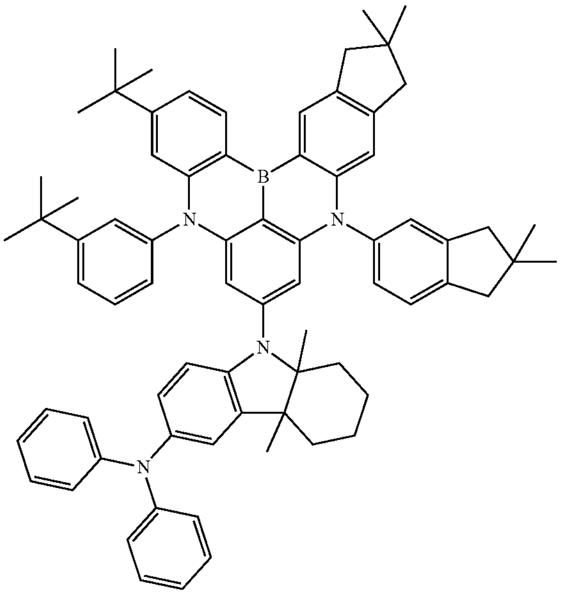
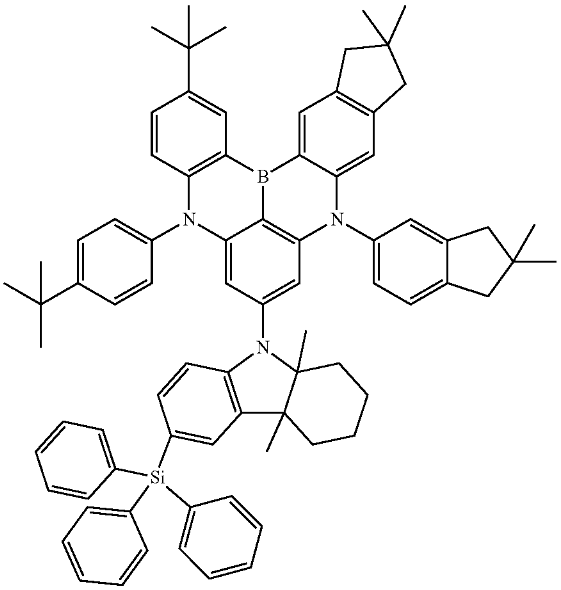
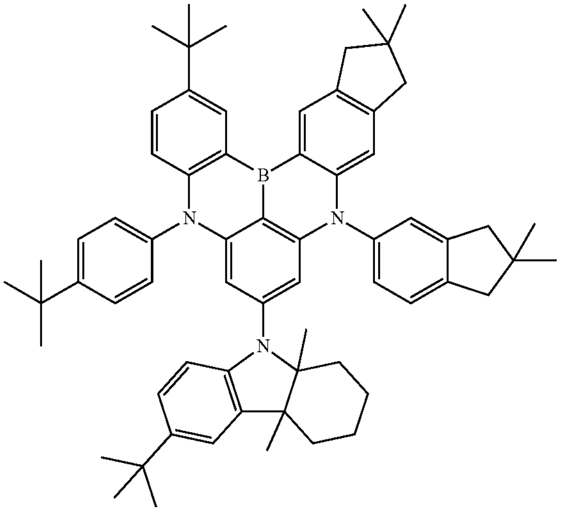
-continued
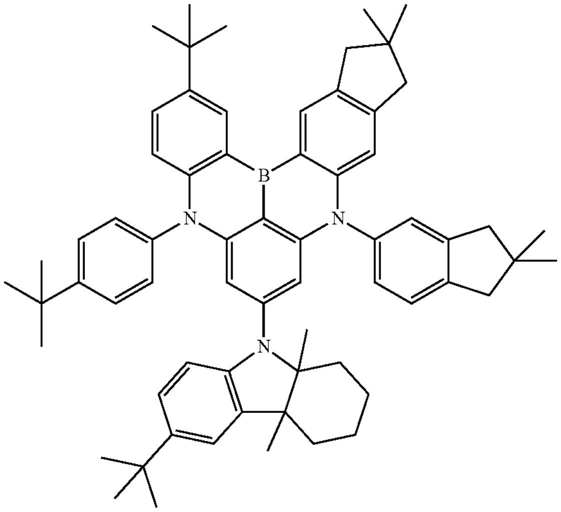
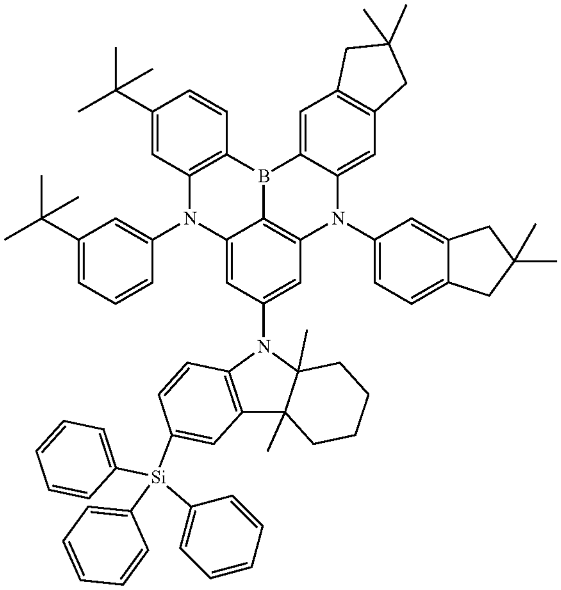
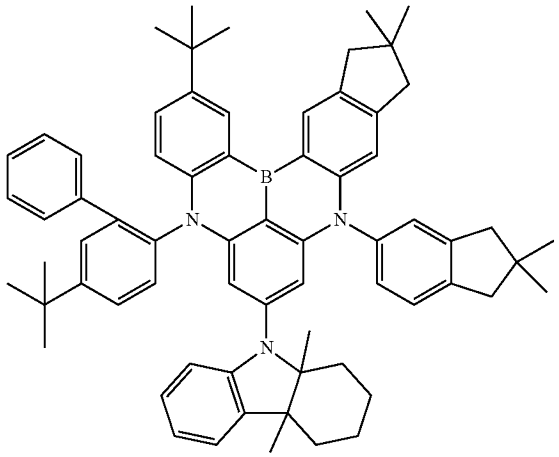

-continued
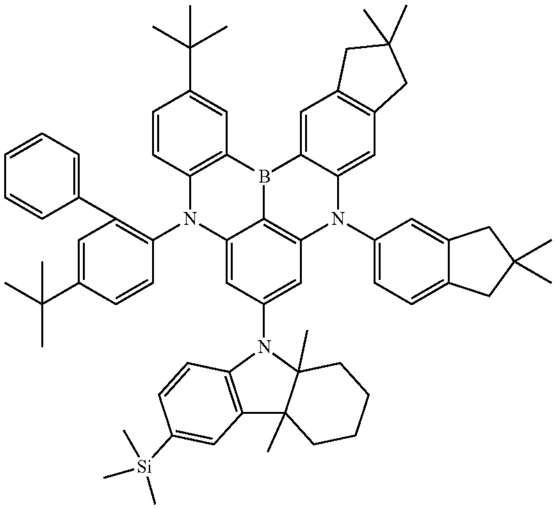
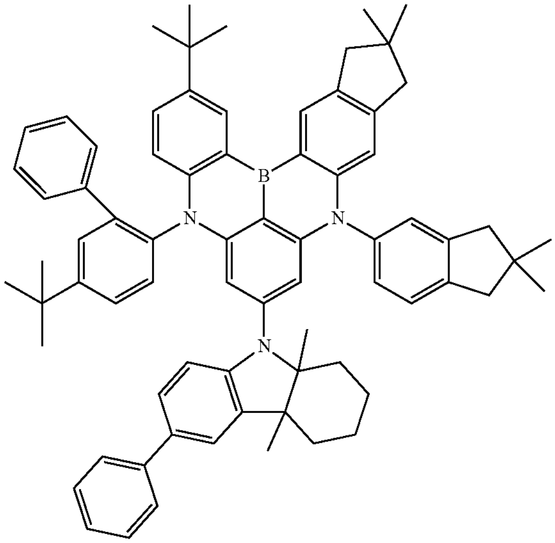
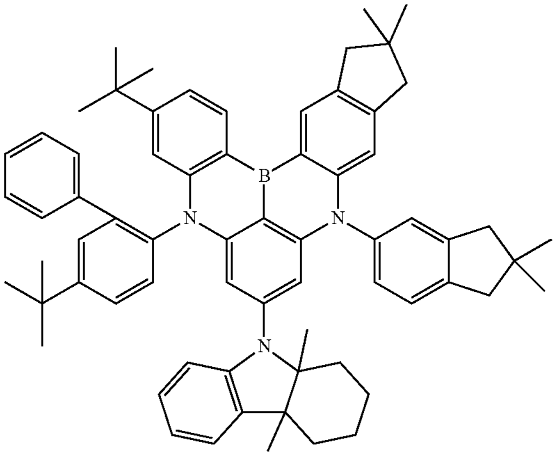
-continued
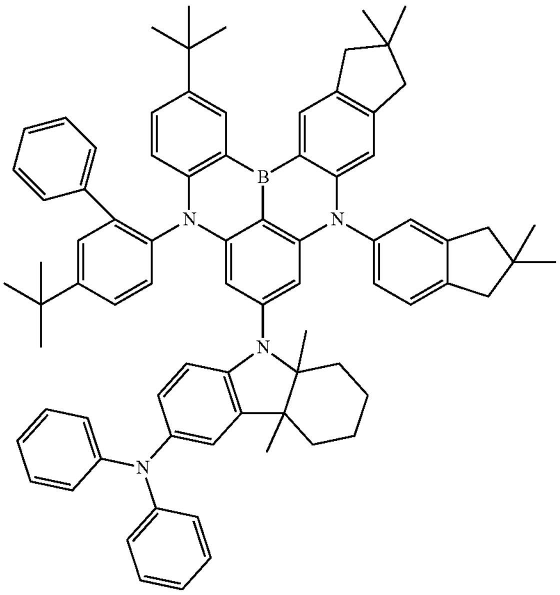
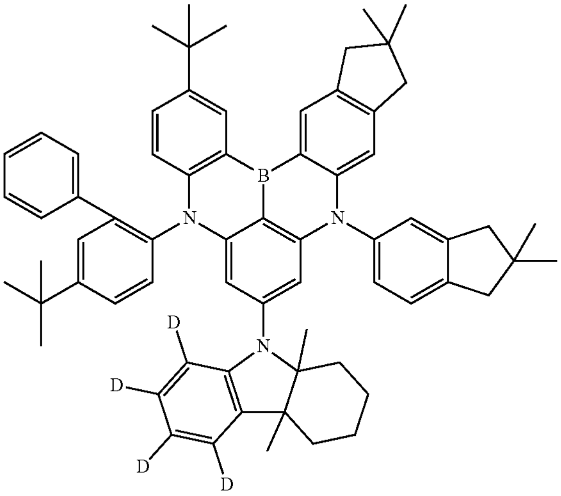
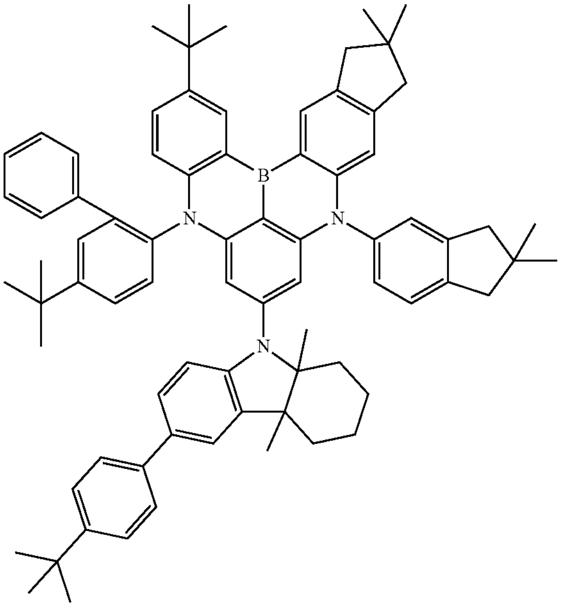

-continued
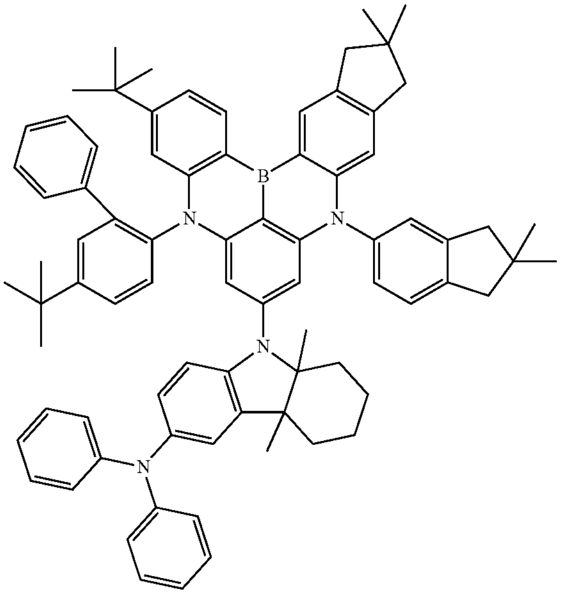
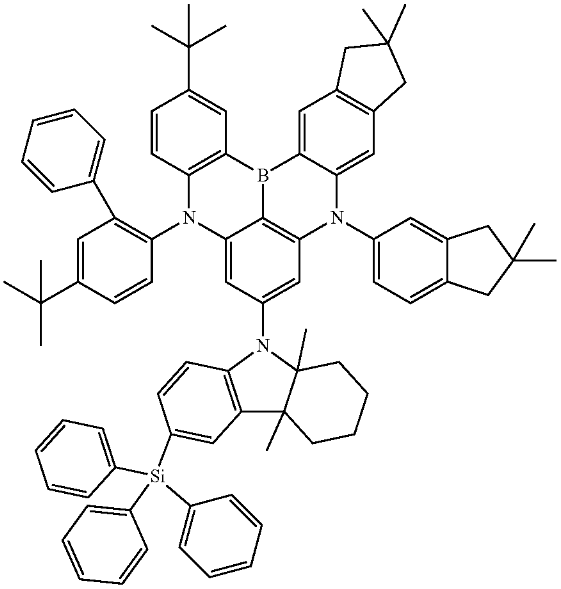
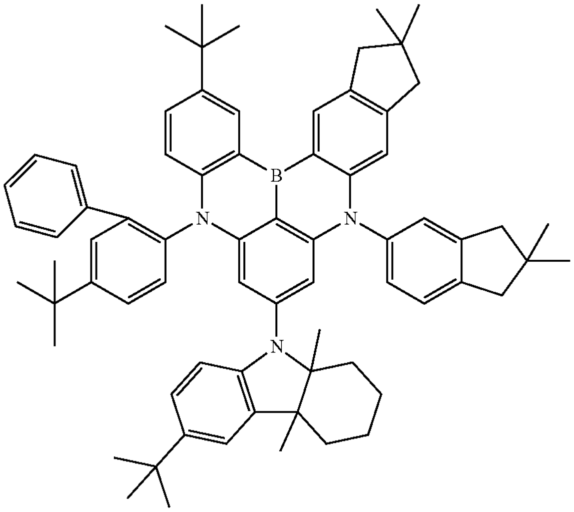
-continued
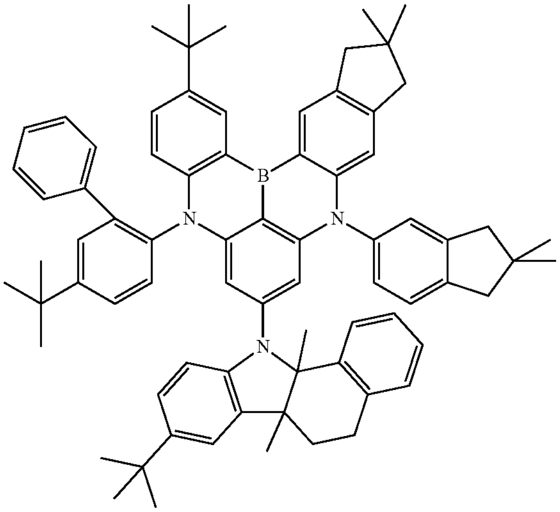
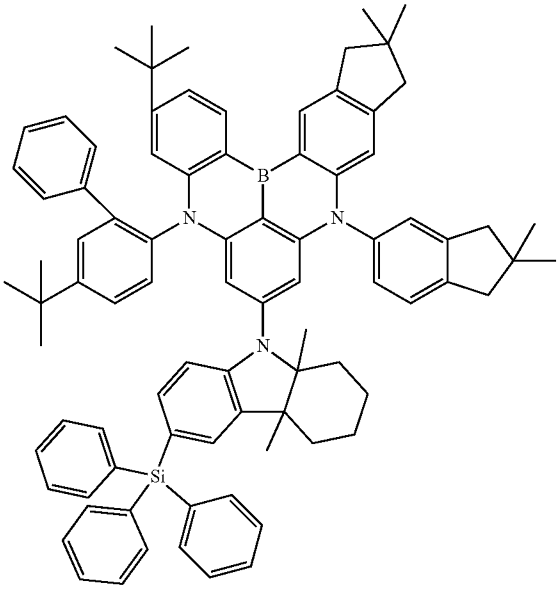
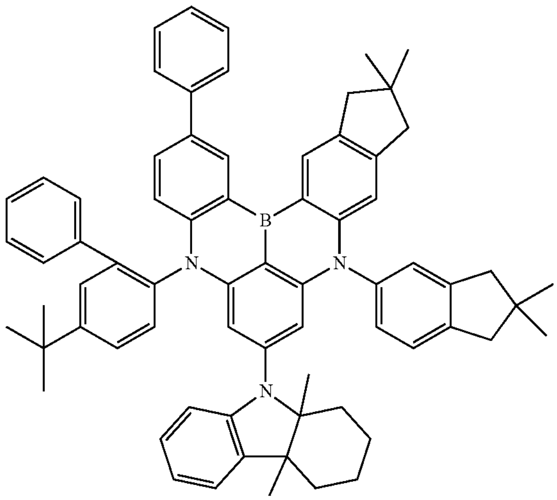

-continued
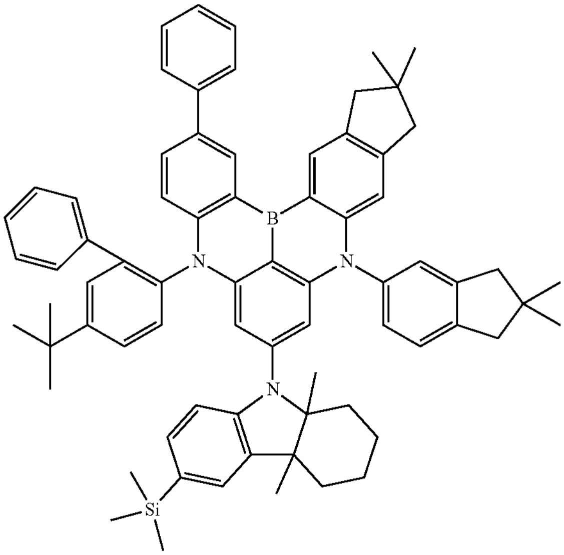
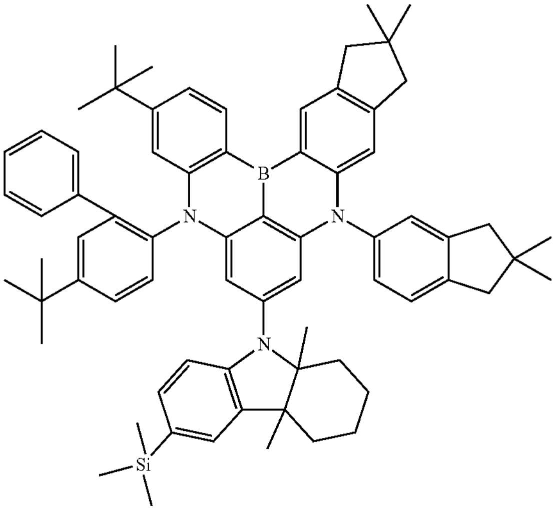
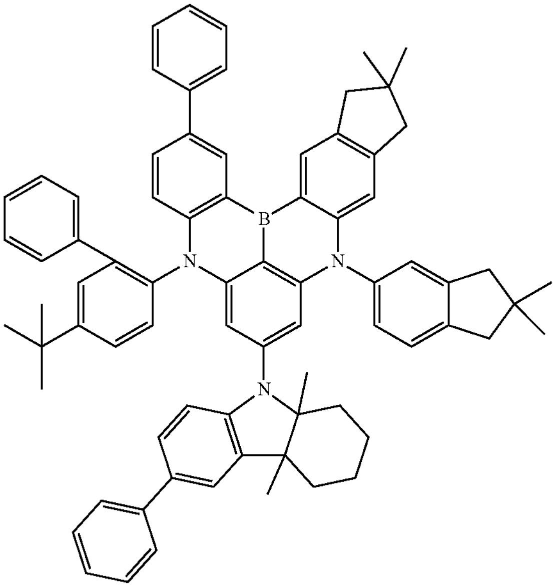
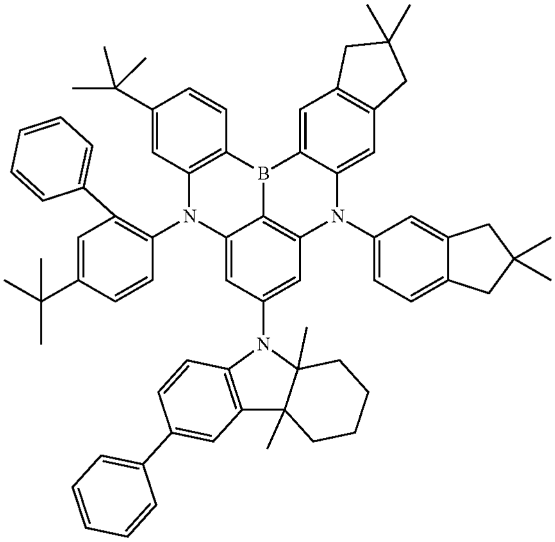
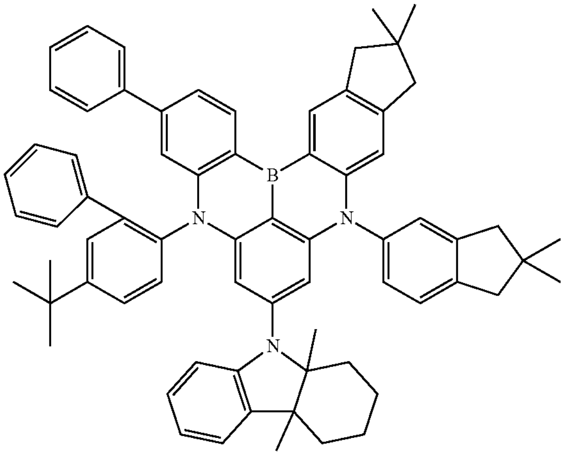 [SMILES: CC1(C)Cc2ccc(N3c4cc5c(cc4B4c6ccc(-c7ccccc7)cc6N(c6ccc(C(C)(C)C)cc6-c6ccccc6)c6cc(N7c8ccccc8C8(C)CCCCC78C)cc3c64)CC(C)(C)C5)cc2C1]
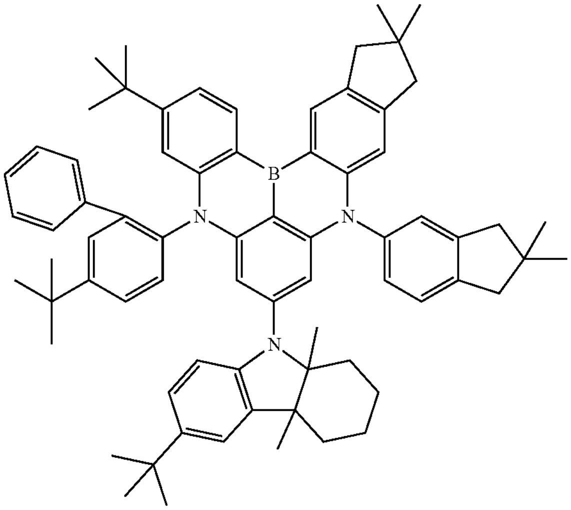

-continued
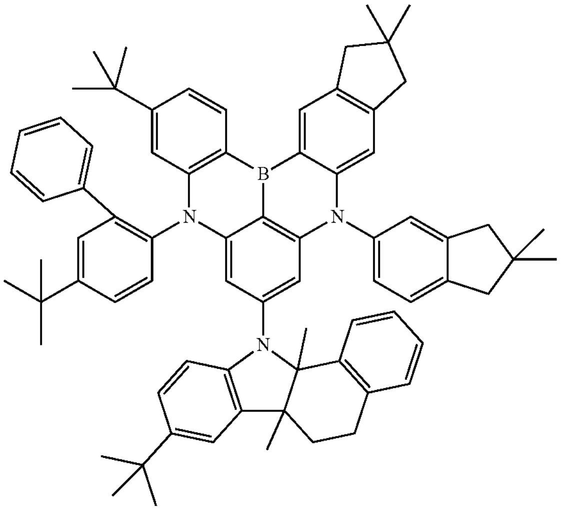
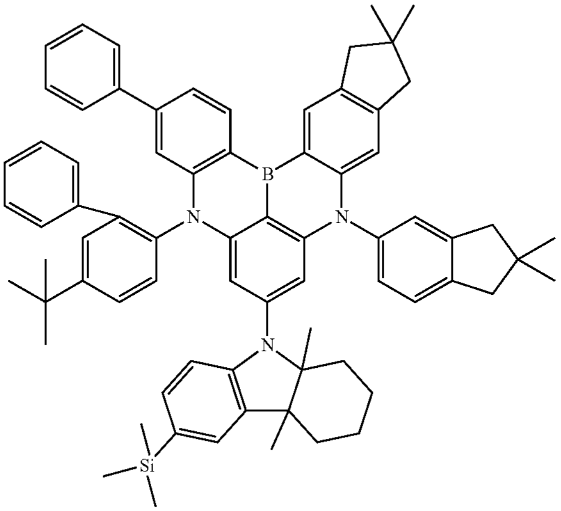
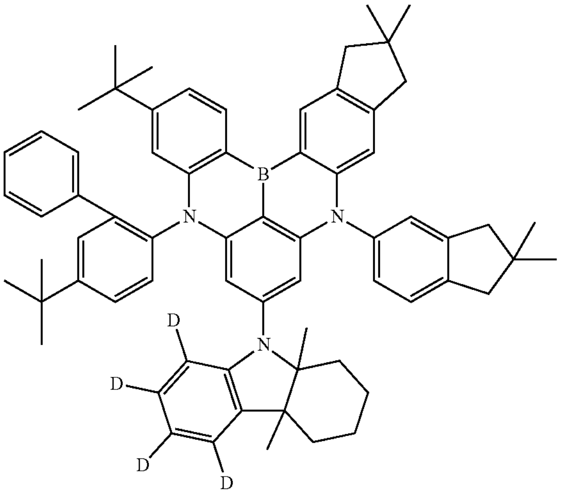
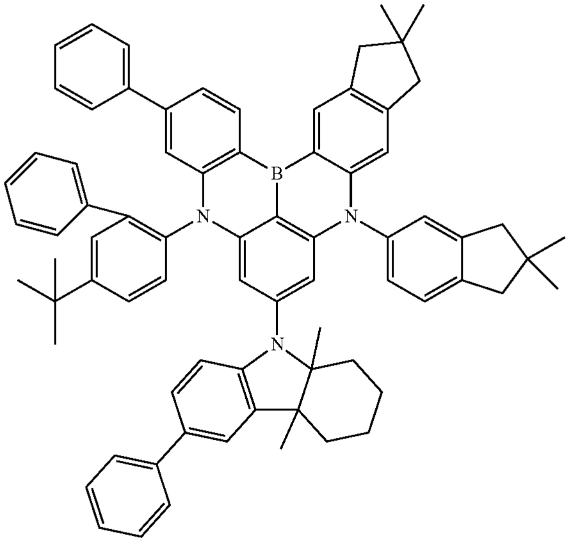
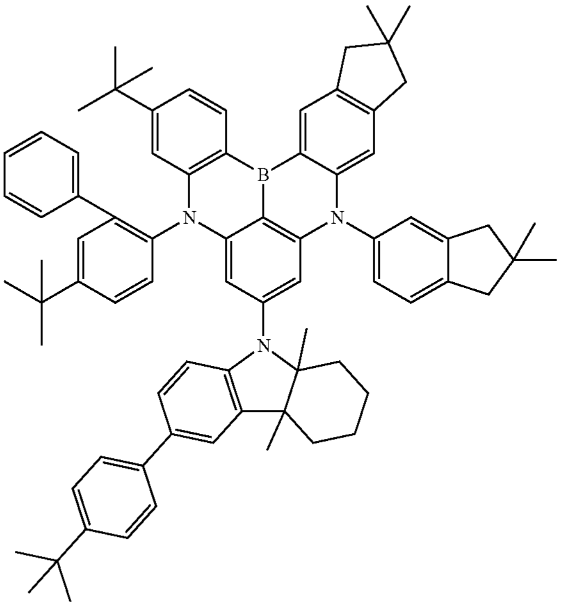
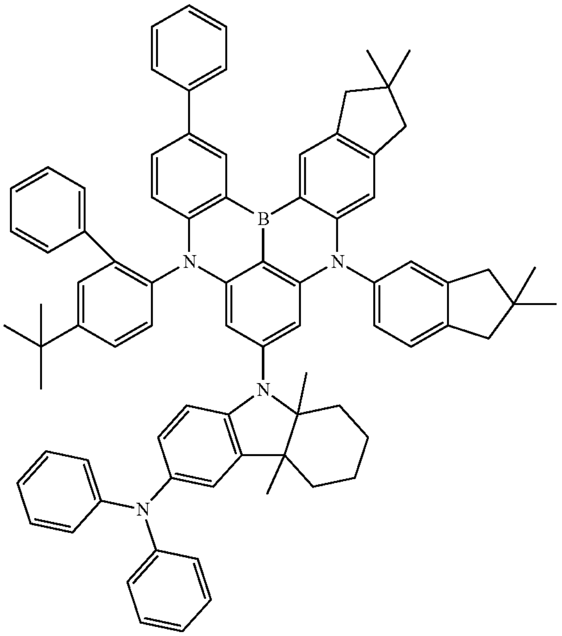
-continued -continued
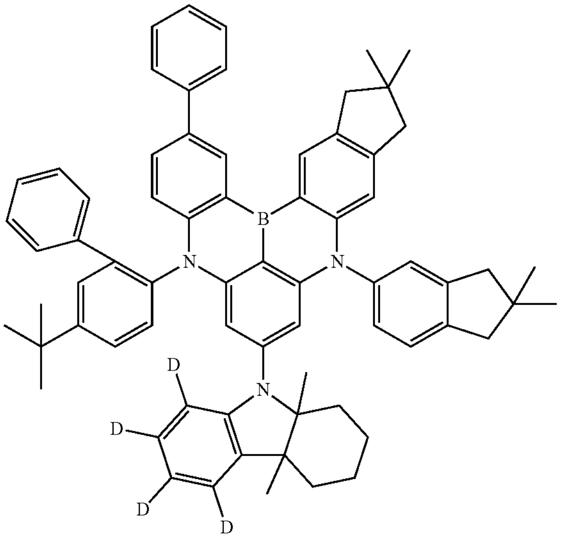
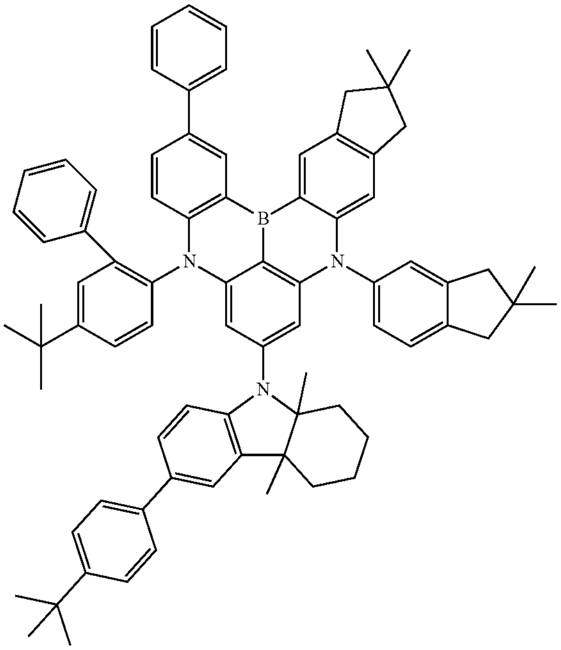
-continued
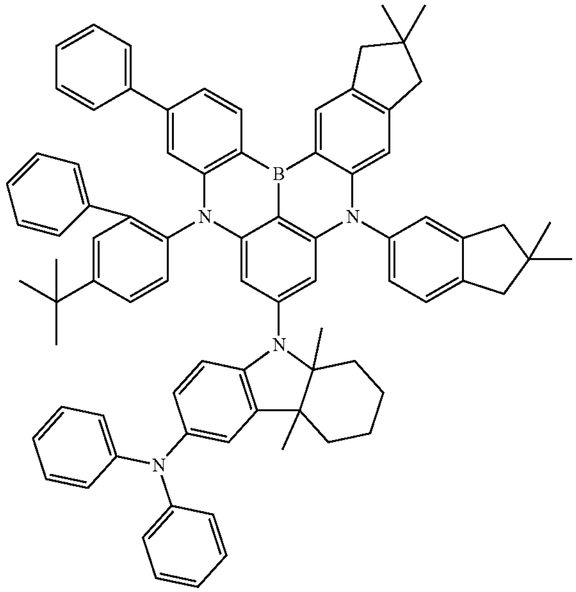
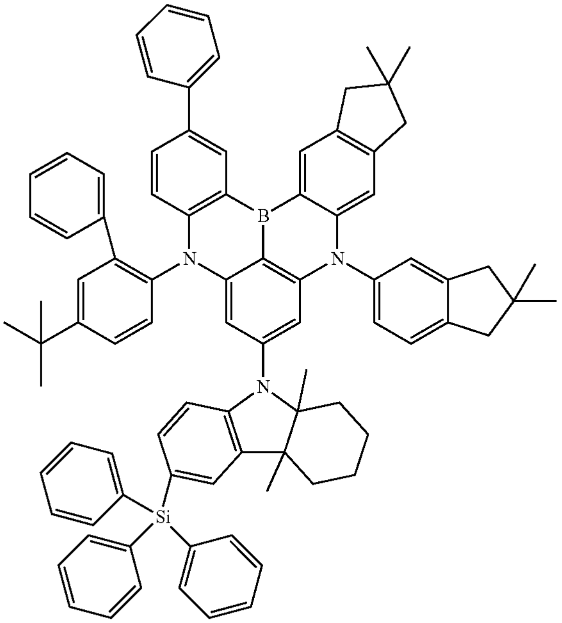

-continued
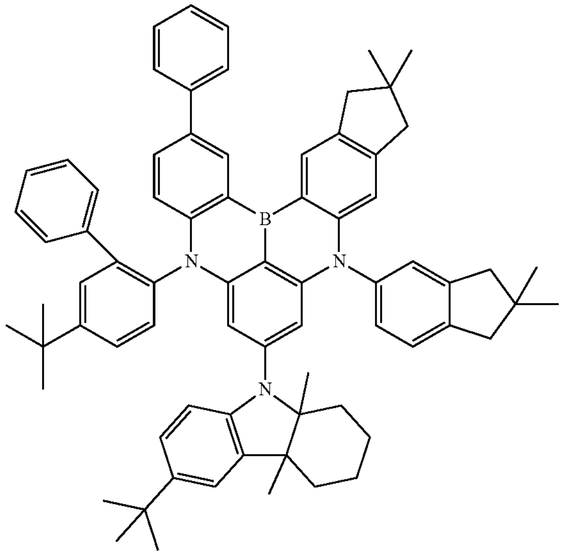
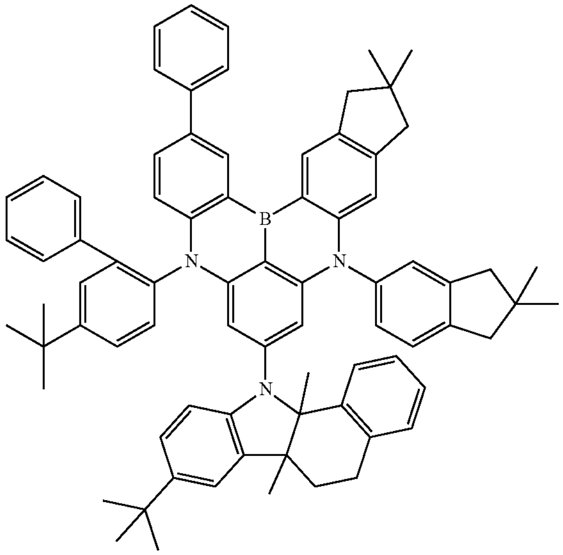
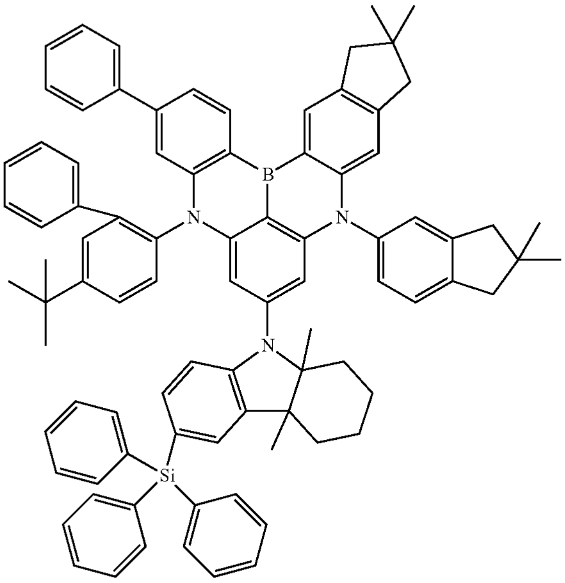
-continued
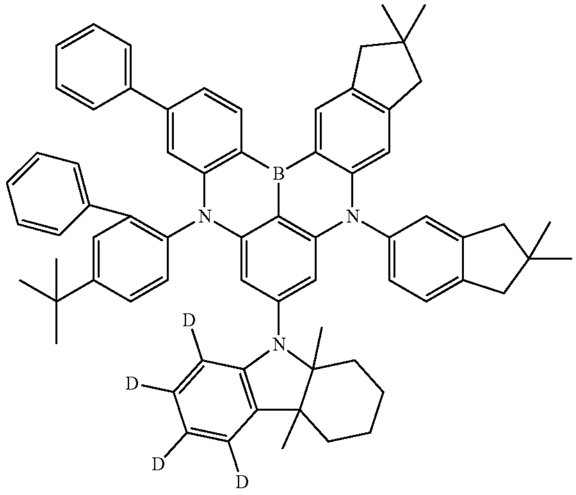
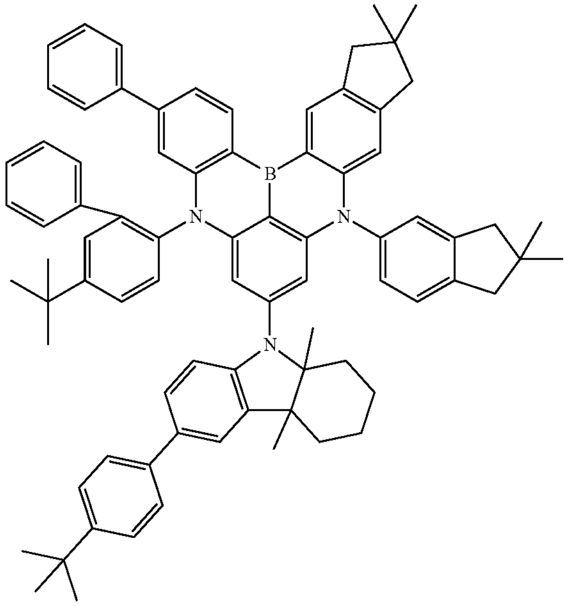
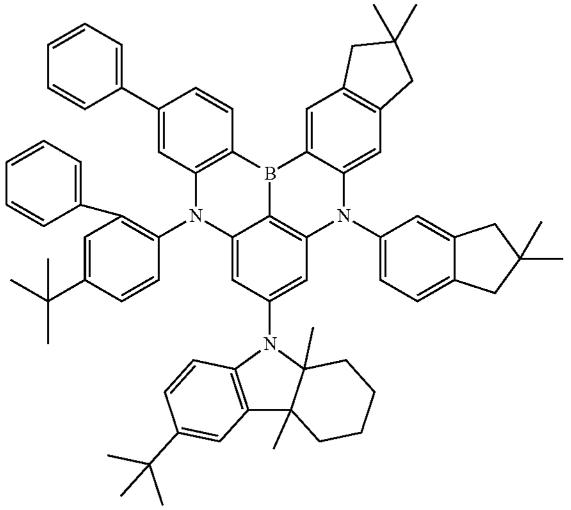

-continued
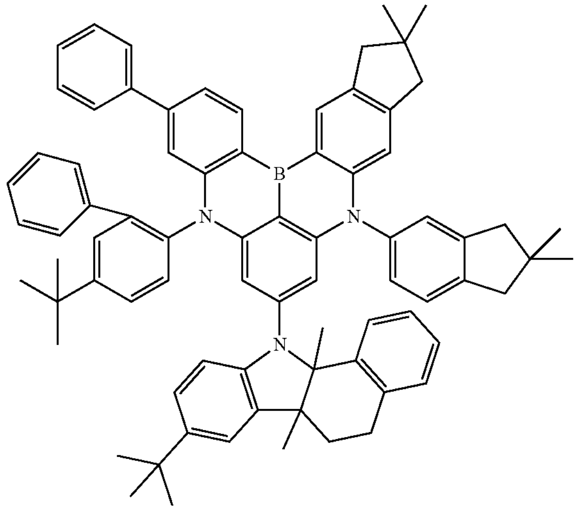
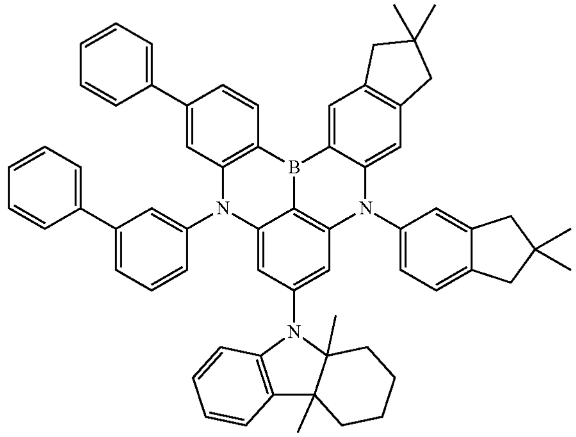
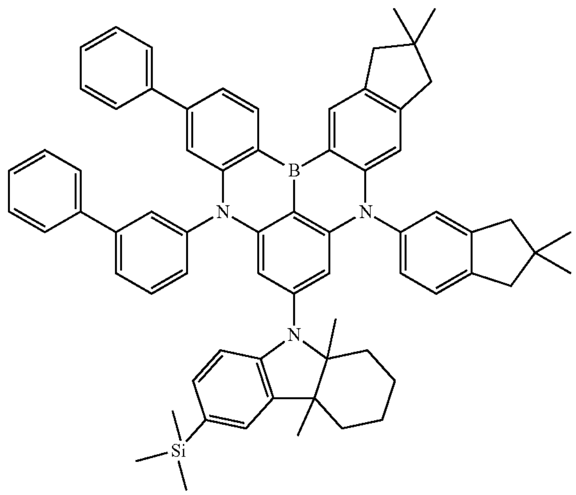
-continued
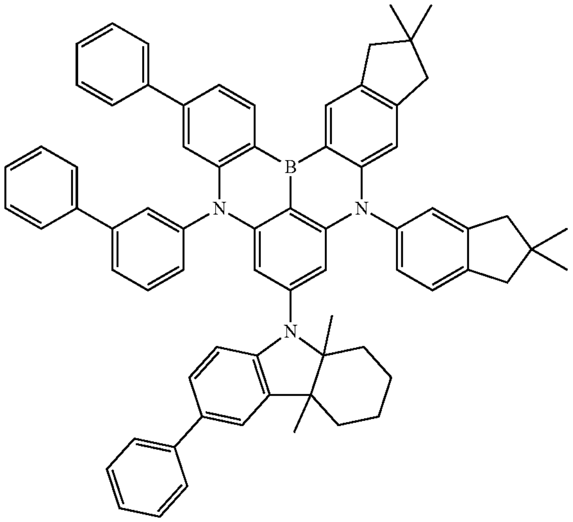
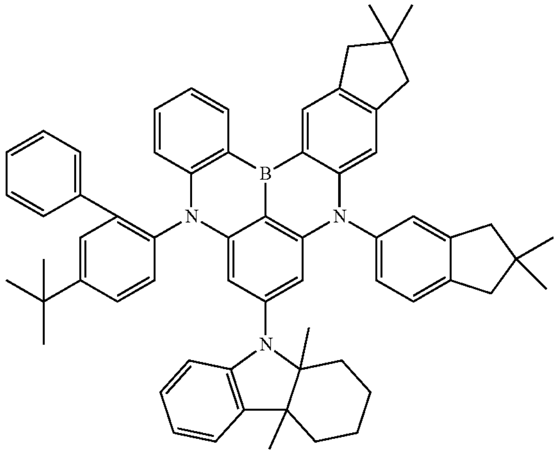
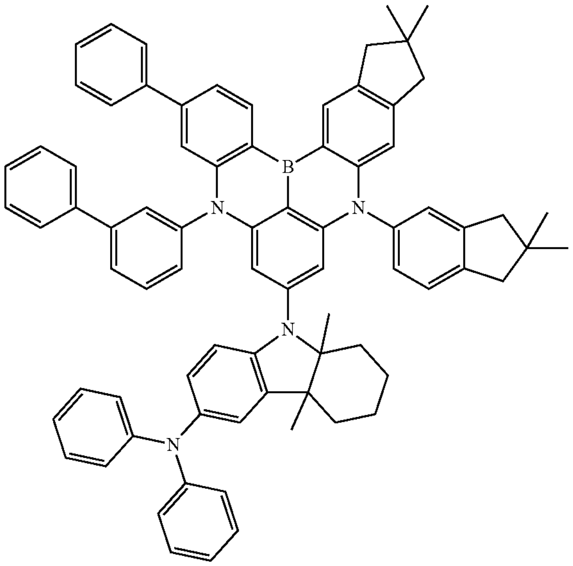

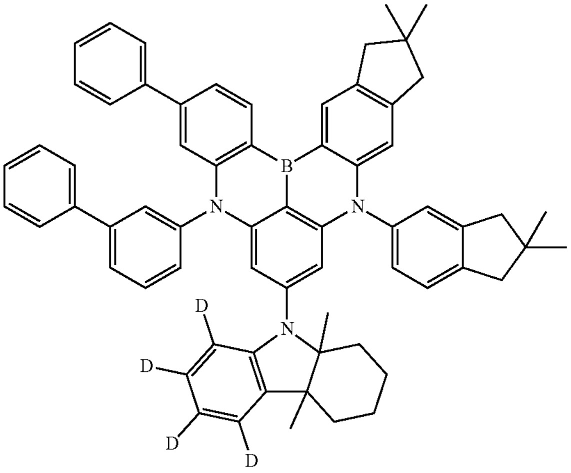
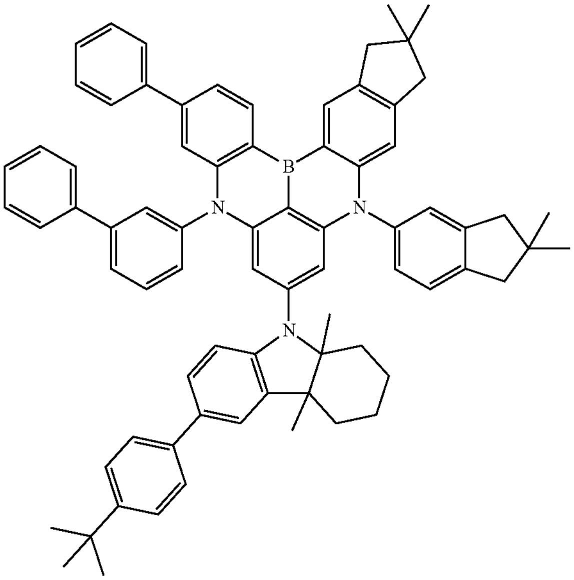
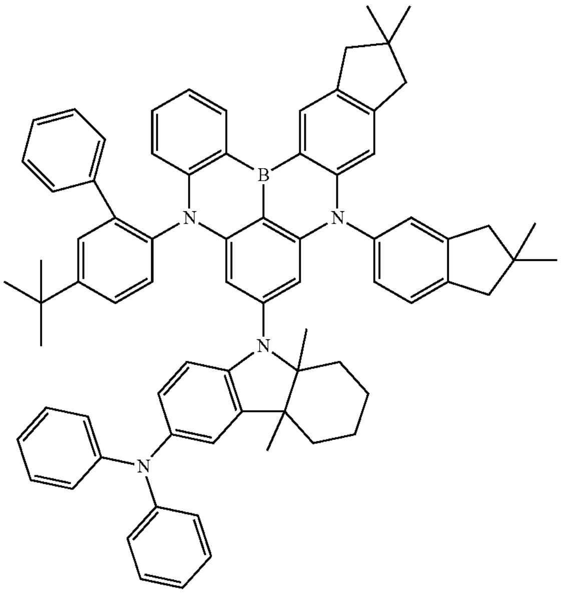
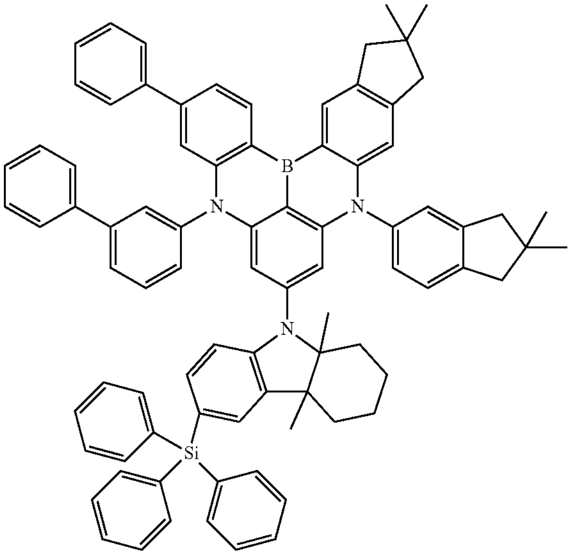
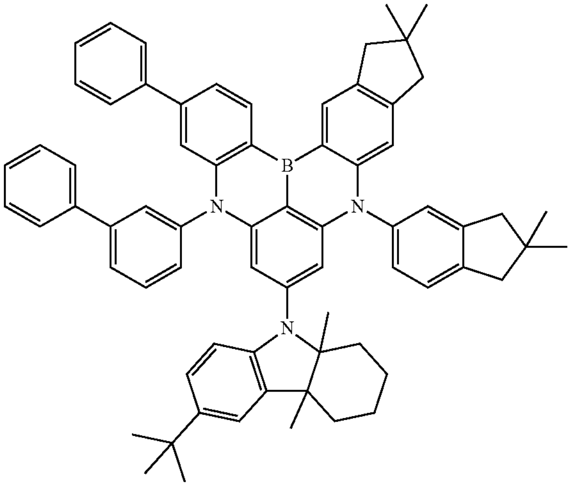
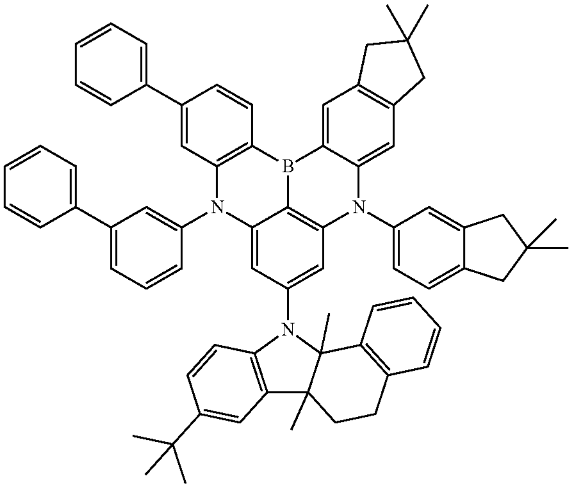

-continued
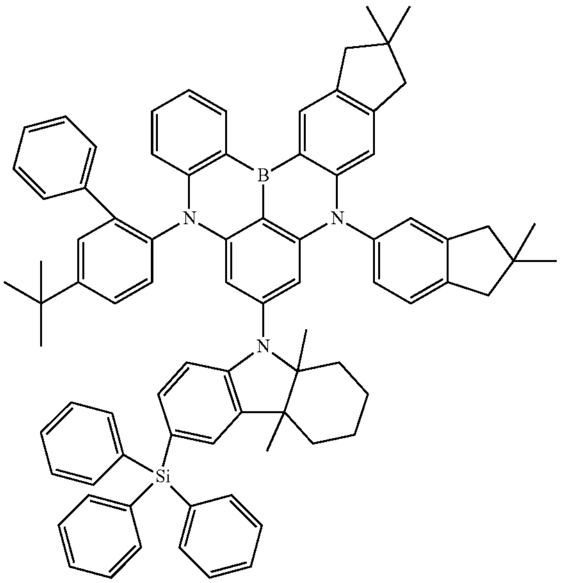
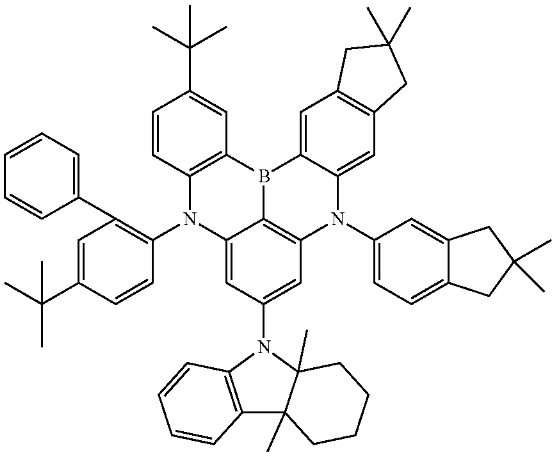
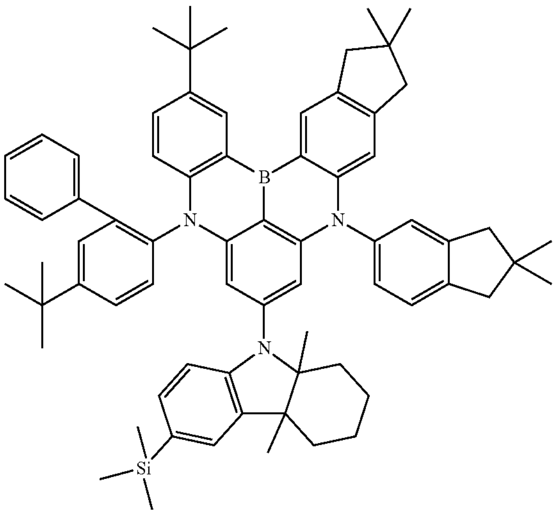
-continued
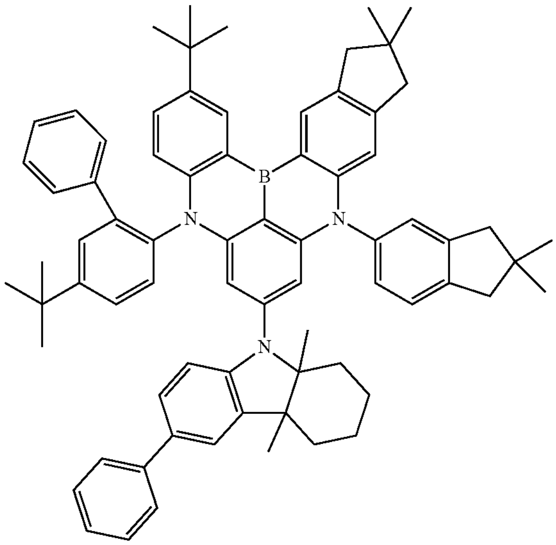
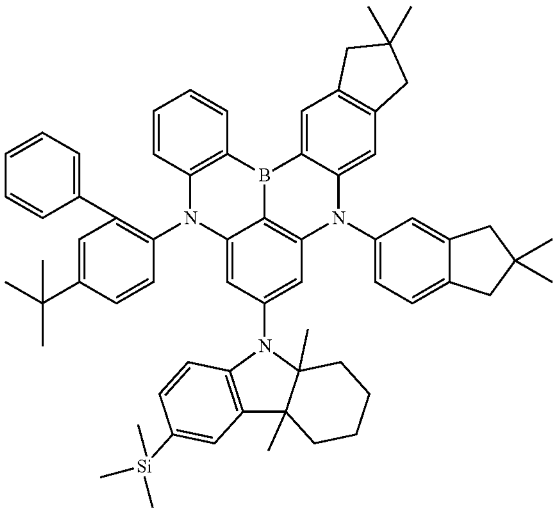 [SMILES: CC1(C)Cc2ccc(N3c4cc5c(cc4B4c6ccccc6N(c6ccc(C(C)(C)C)cc6-c6ccccc6)c6cc(N7c8ccc([Si](C)(C)C)cc8C8(C)CCCCC78C)cc3c64)CC(C)(C)C5)cc2C1]

-continued
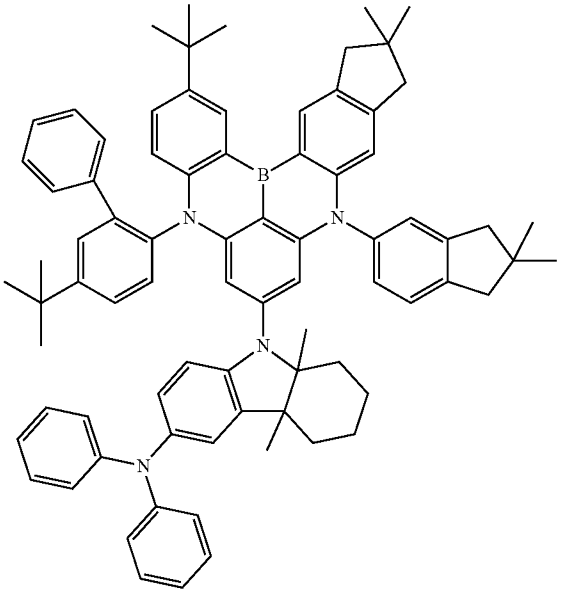
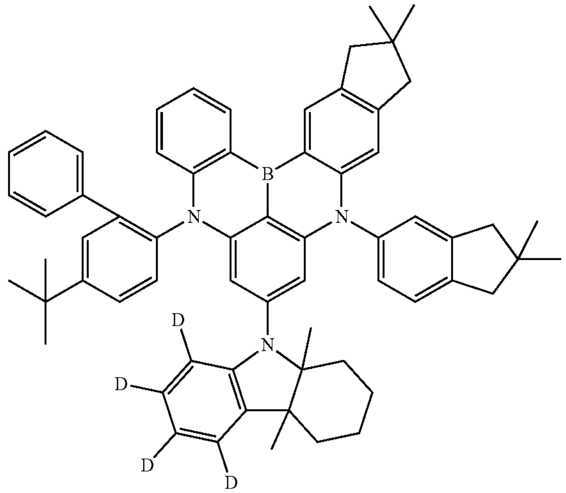
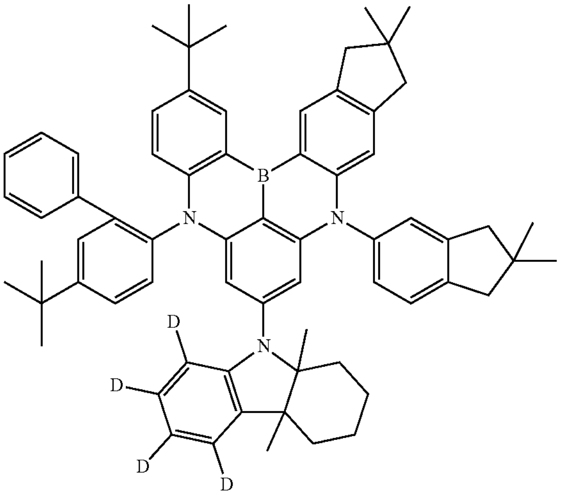
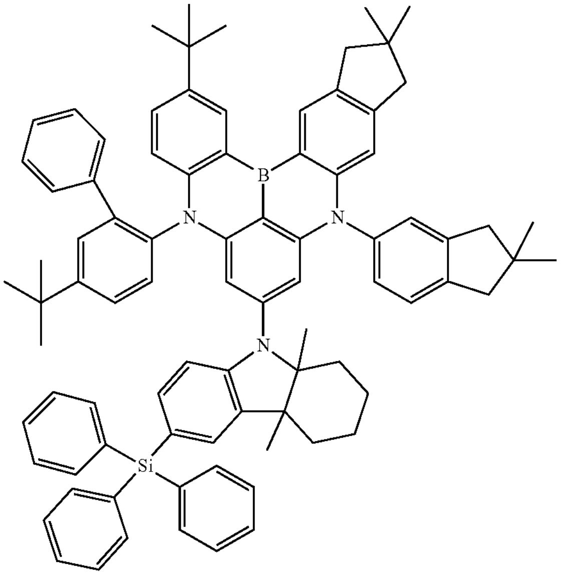
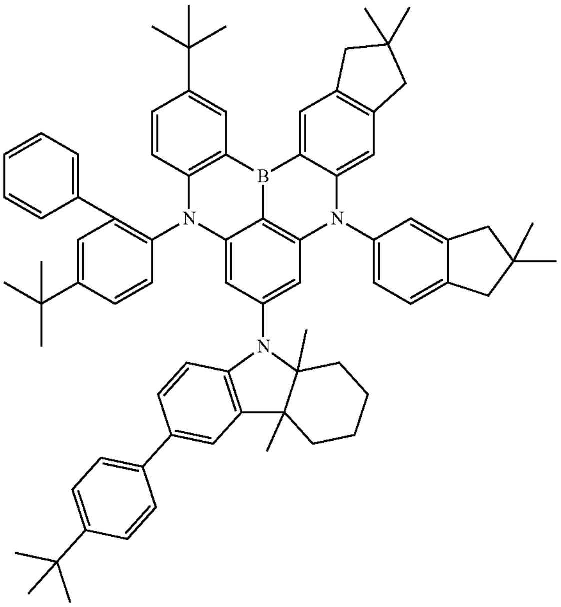
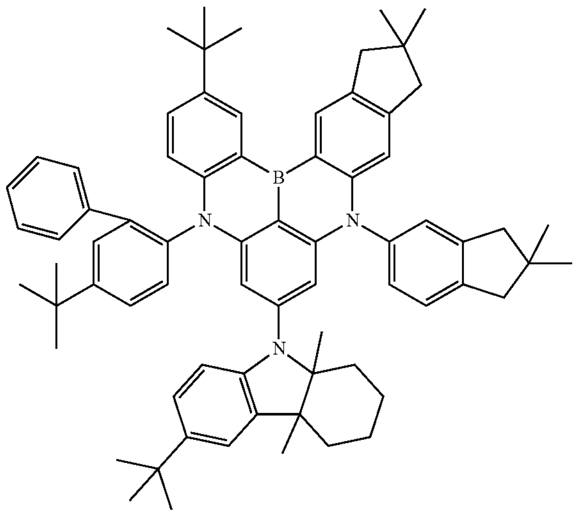

-continued
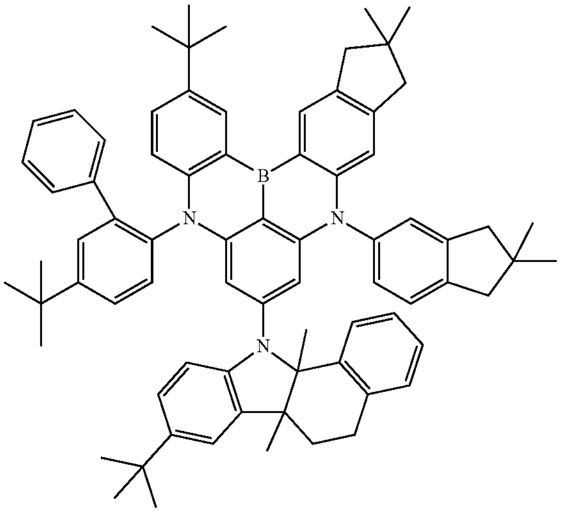
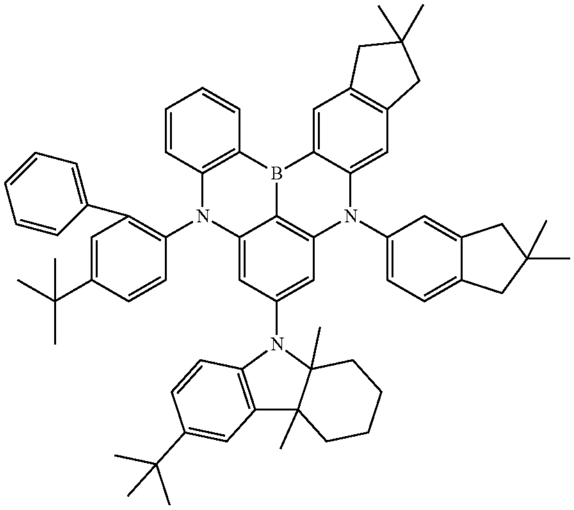
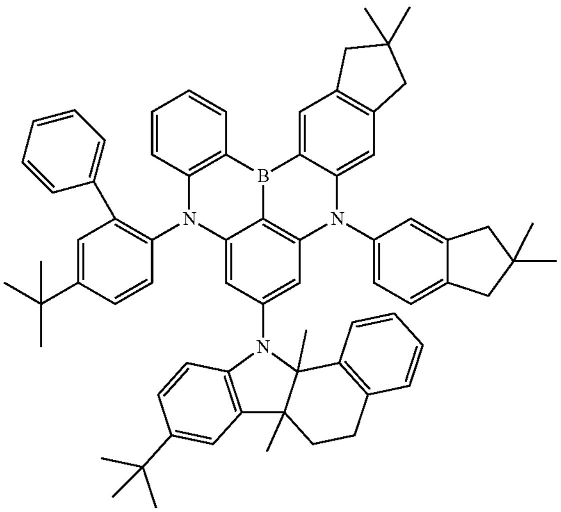
-continued
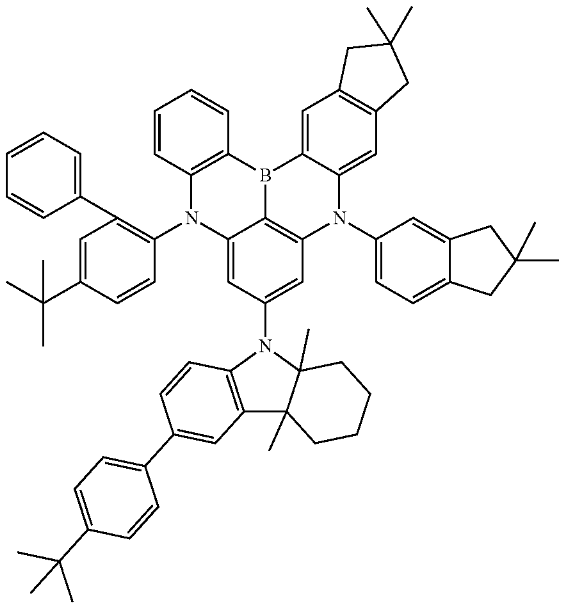
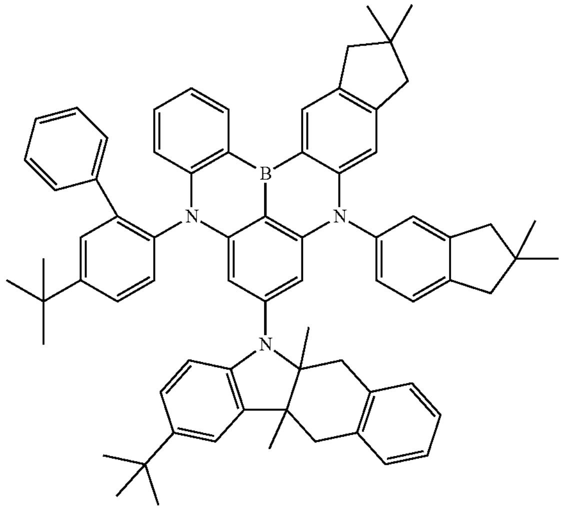
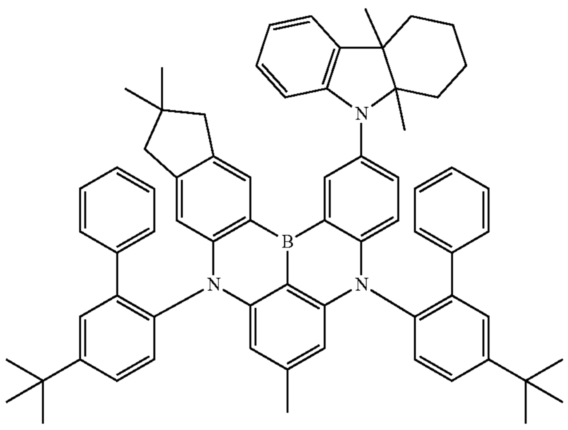

-continued
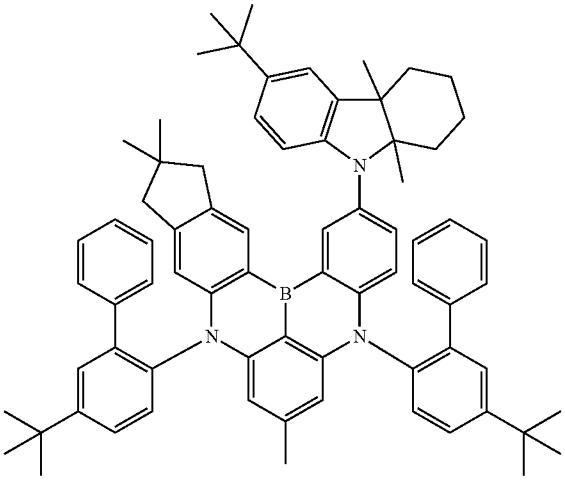
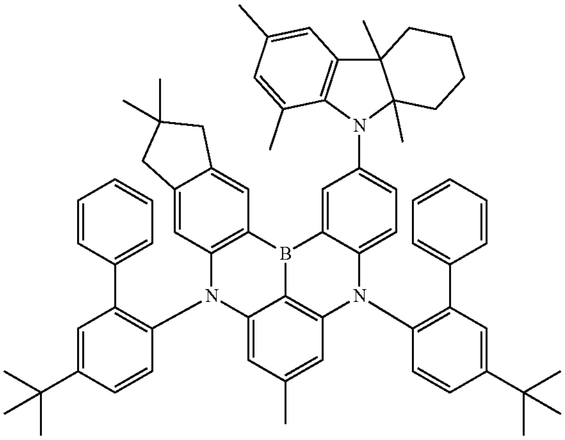
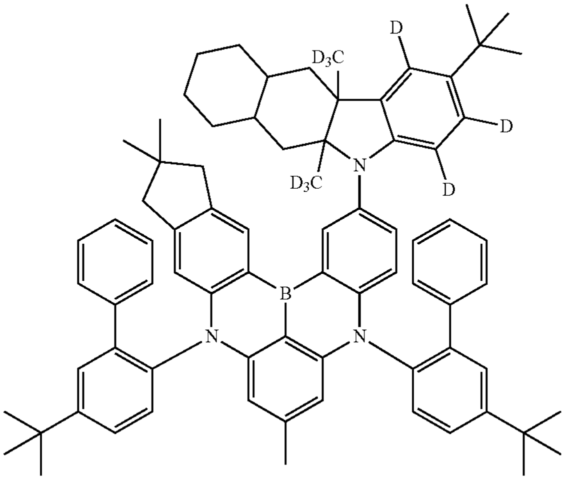
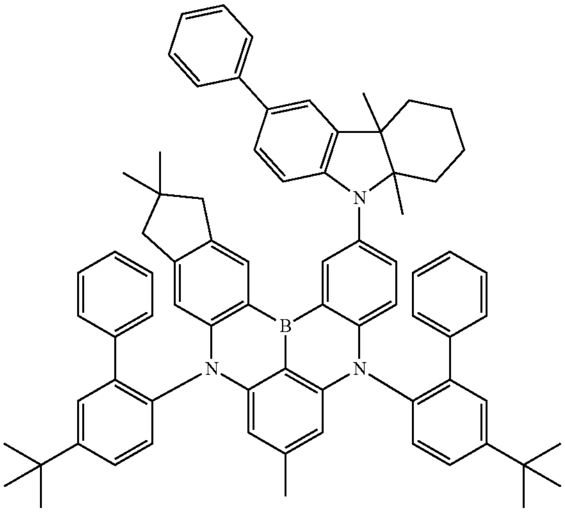
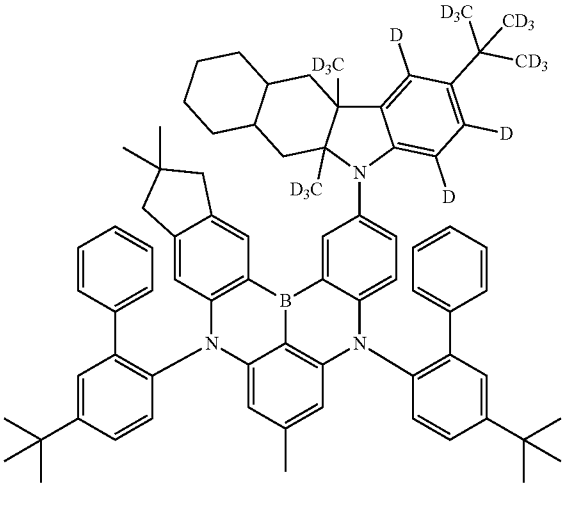
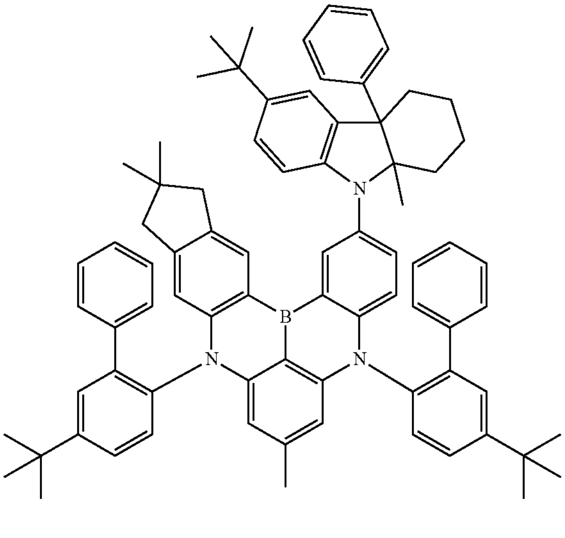
-continued -continued
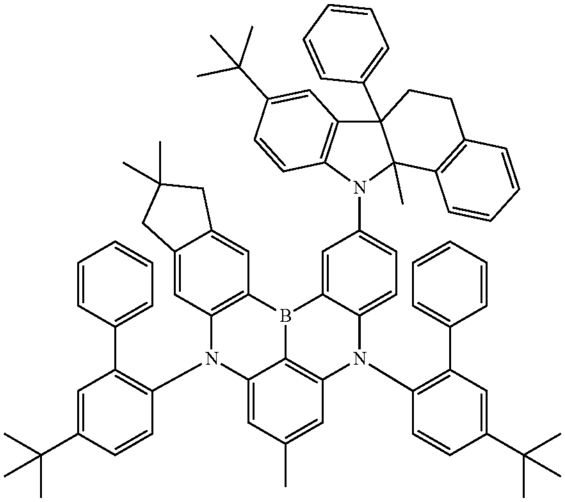
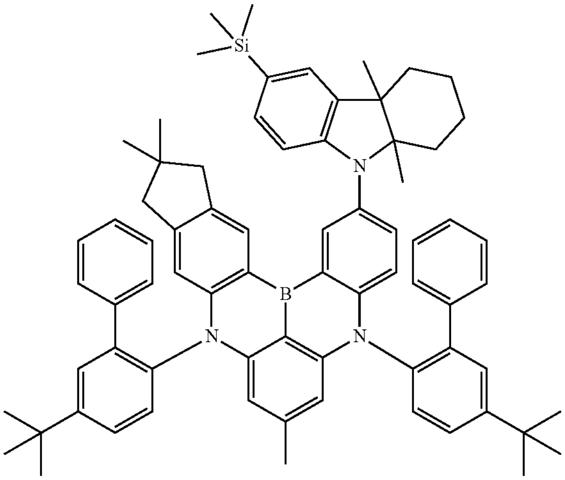
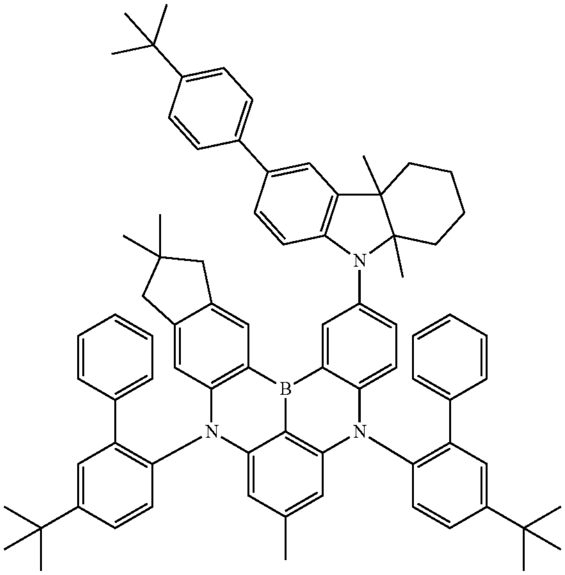
-continued
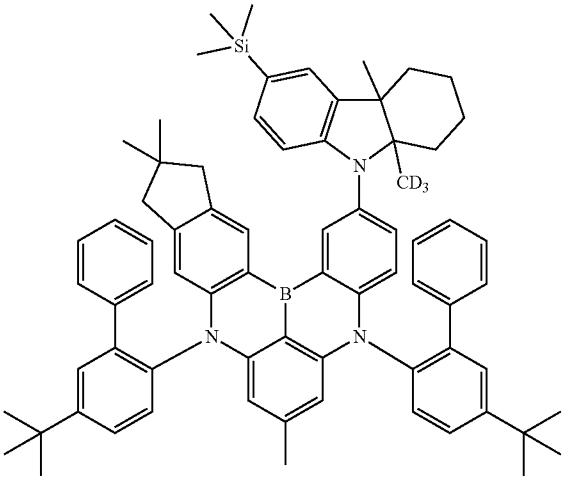
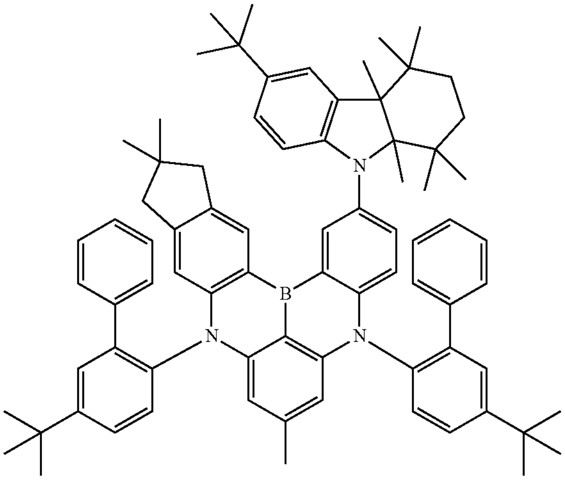
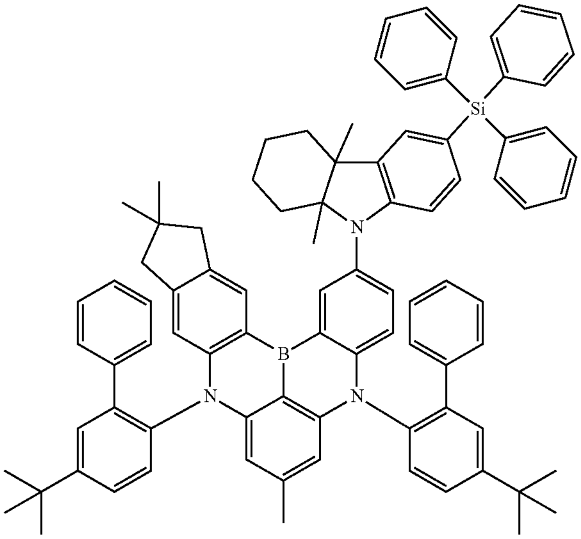

-continued
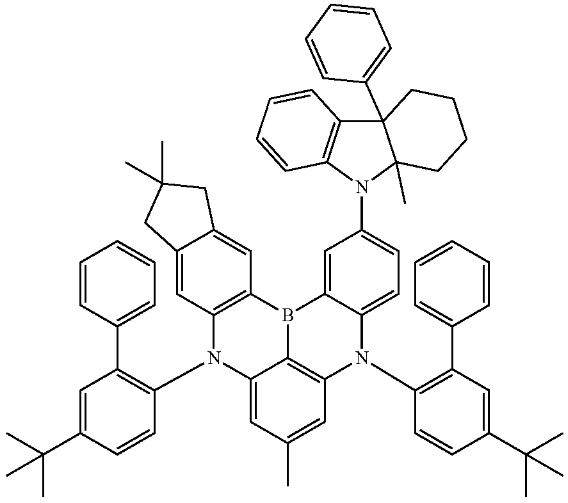
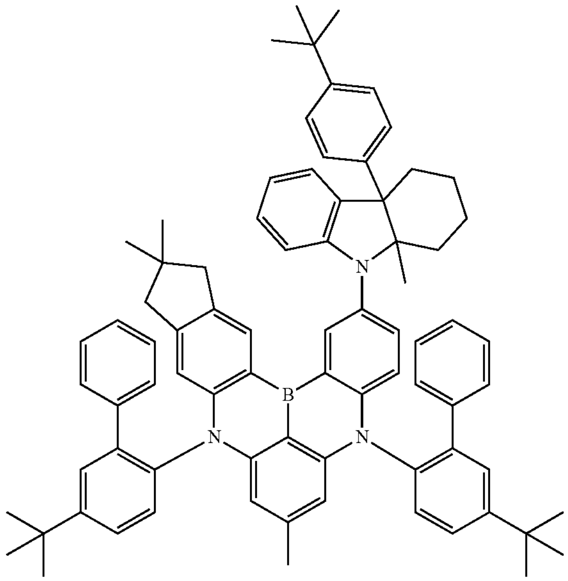
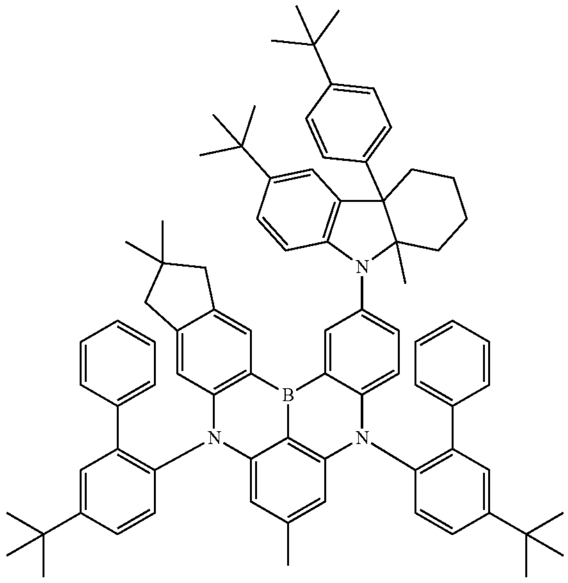
-continued
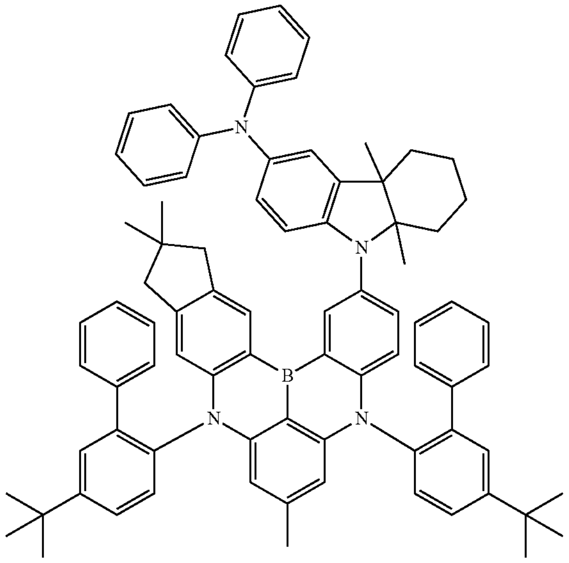
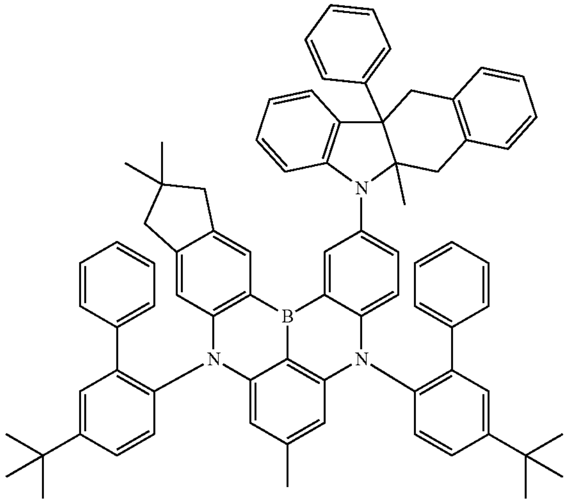
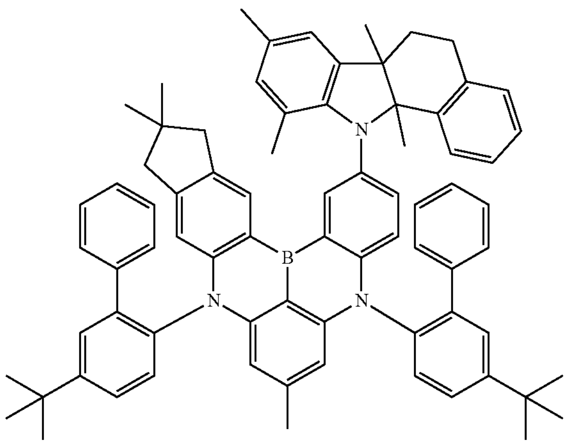

-continued
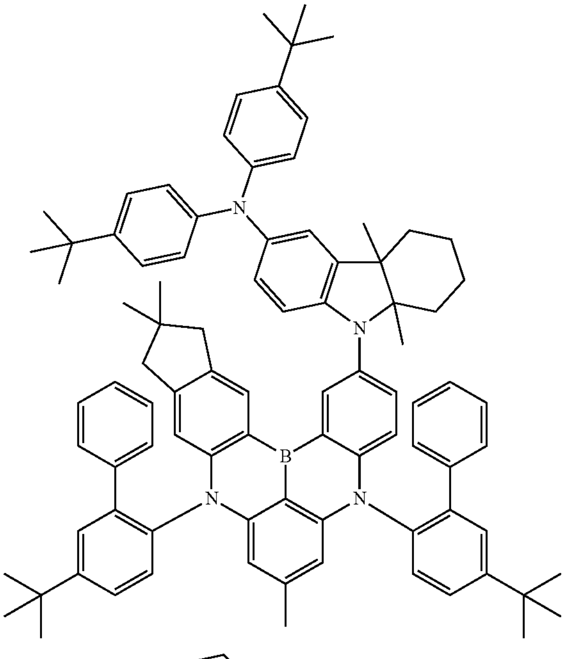
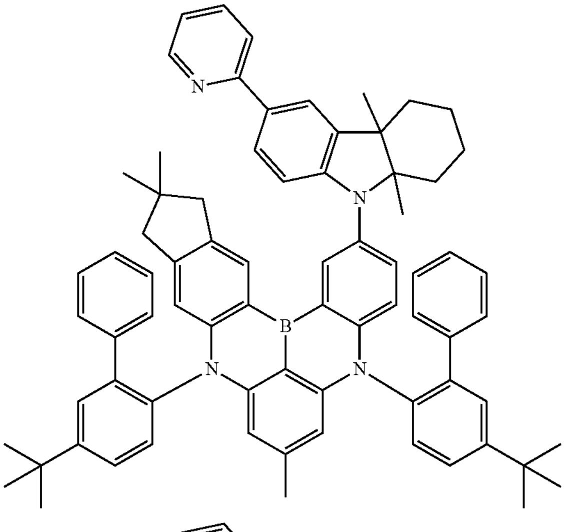
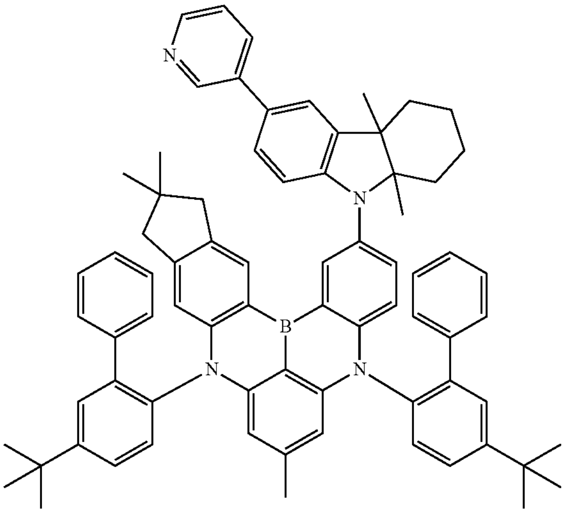
-continued
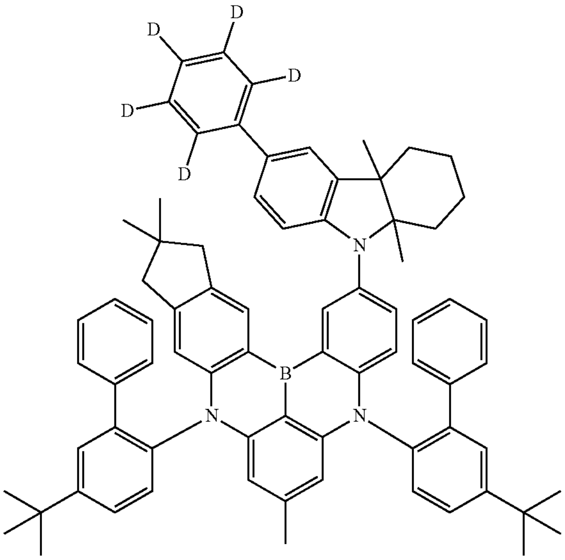
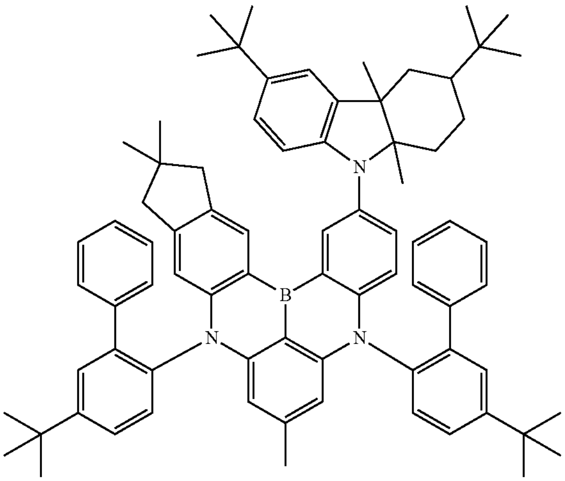
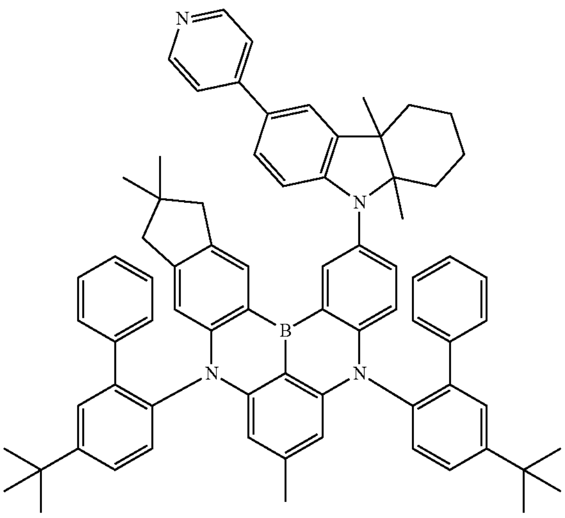

-continued
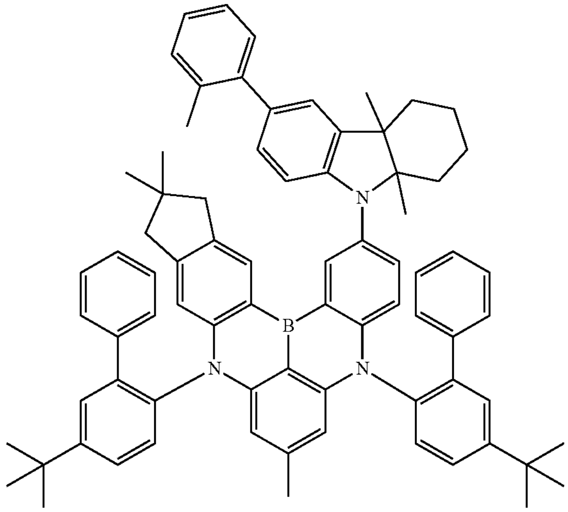
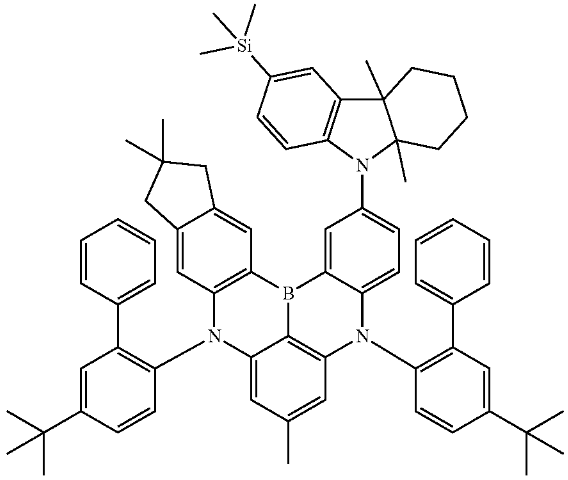
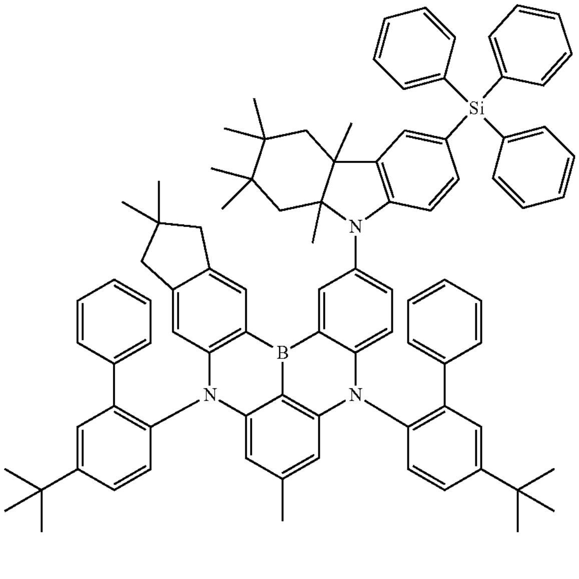
-continued
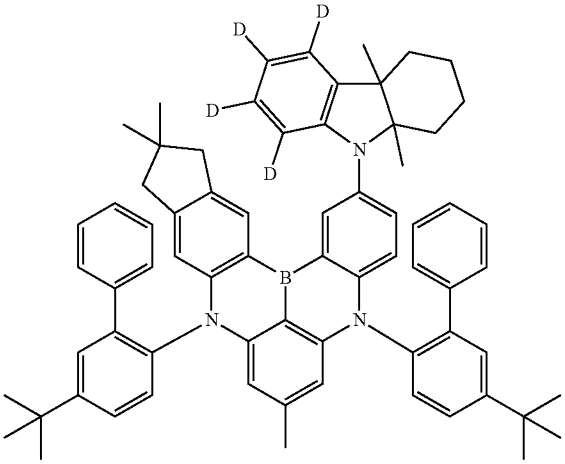
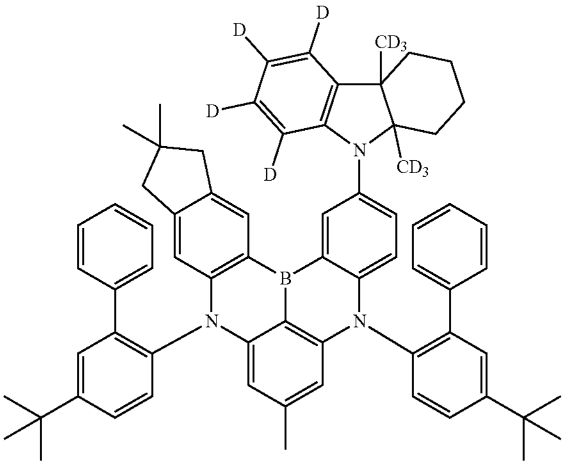
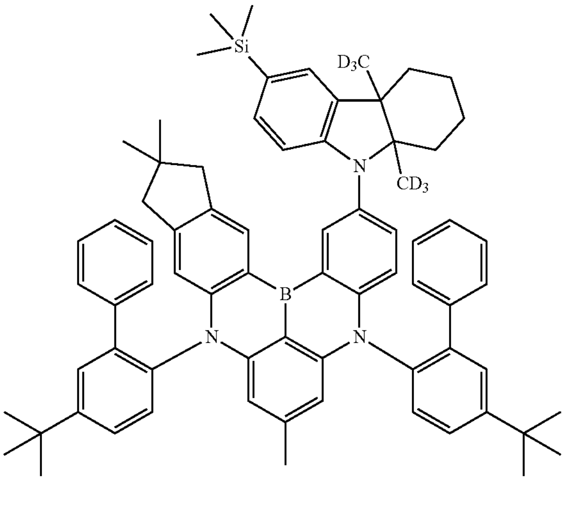

-continued
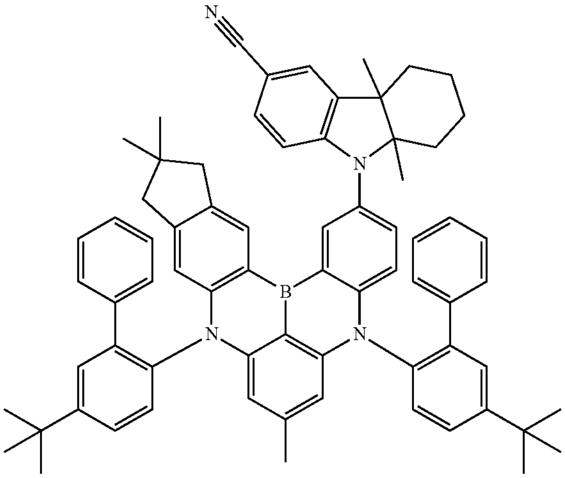
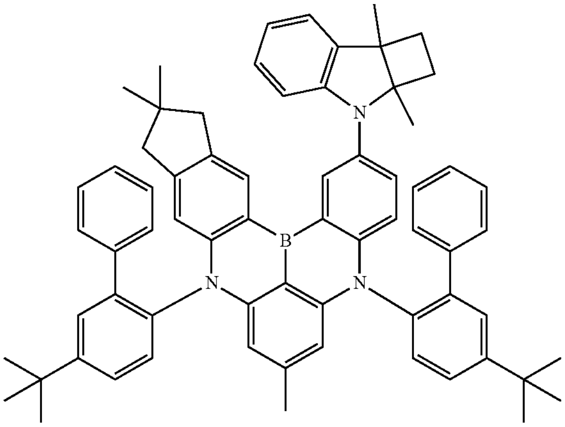
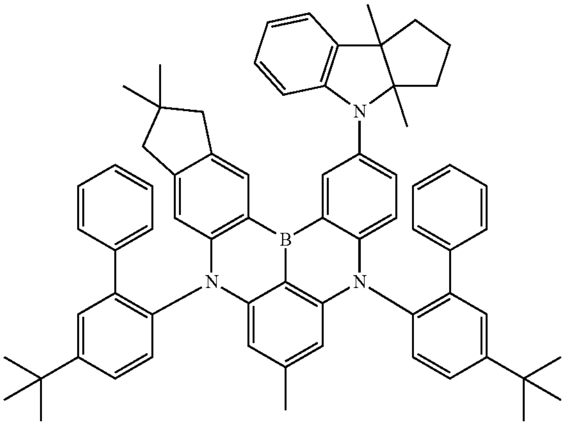
-continued
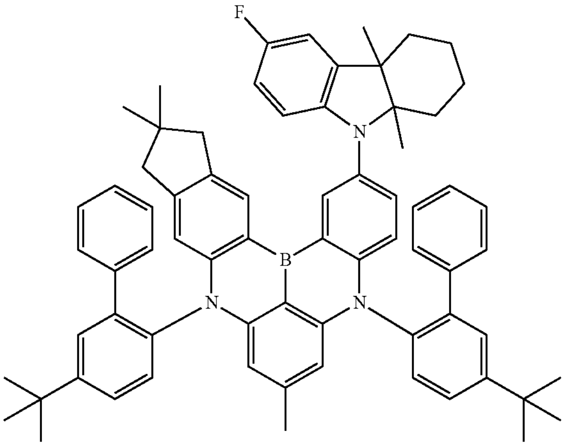
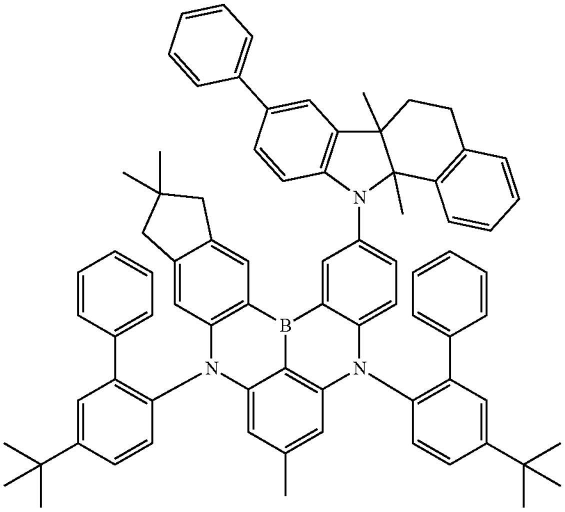
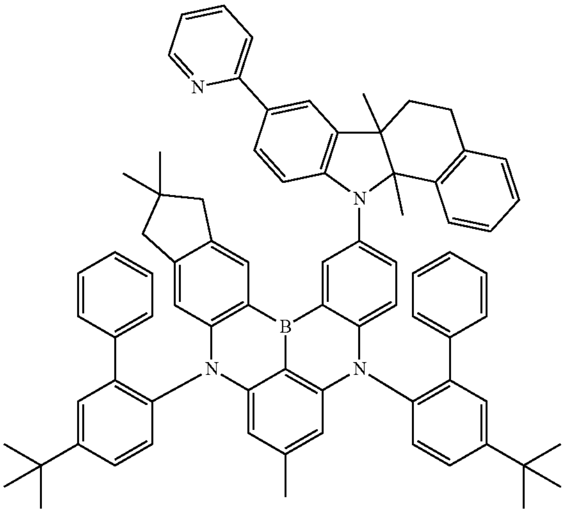

-continued
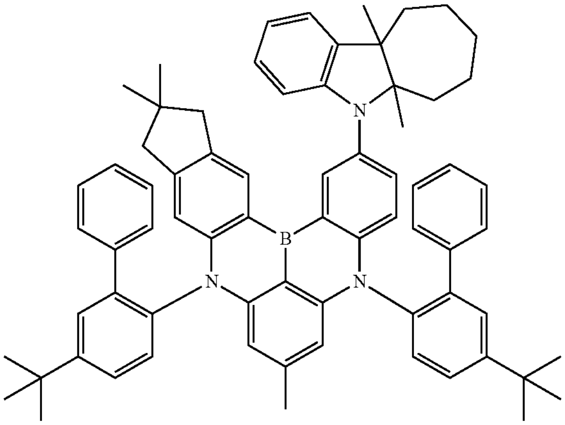
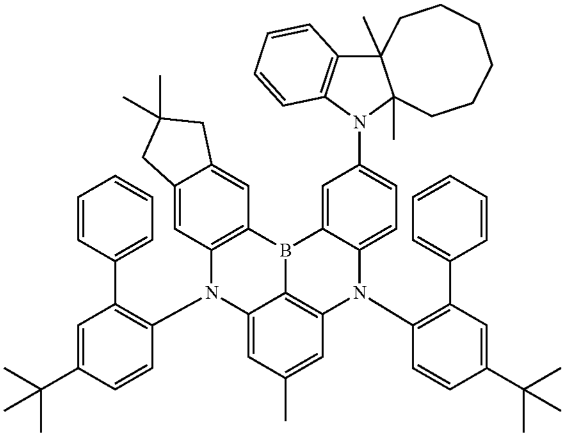
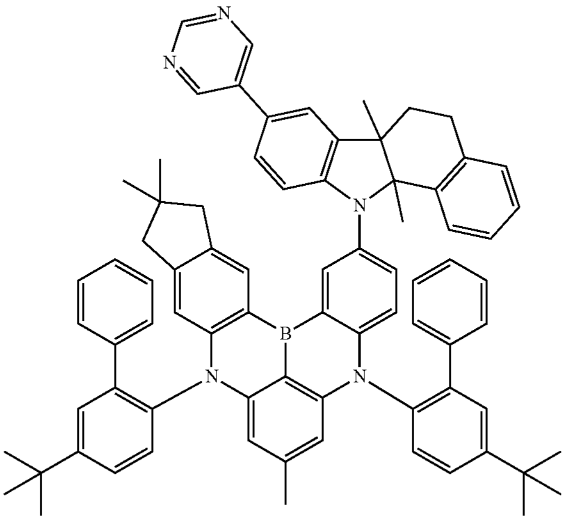
-continued
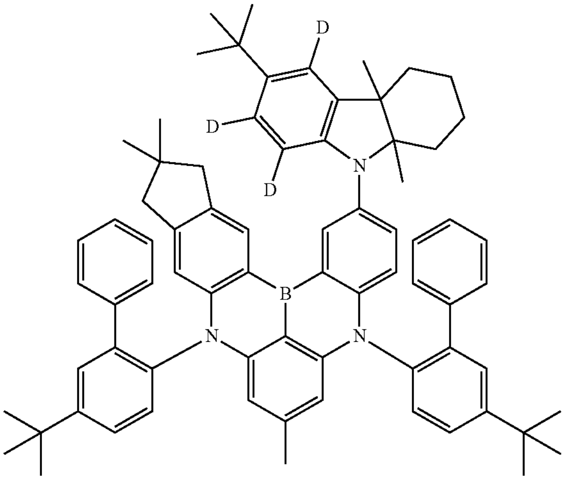
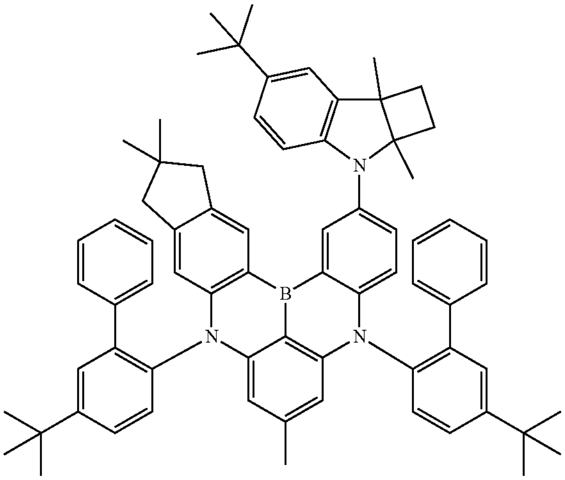
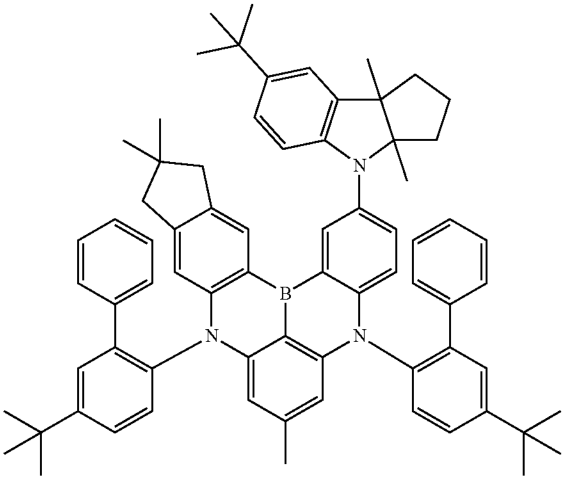

-continued
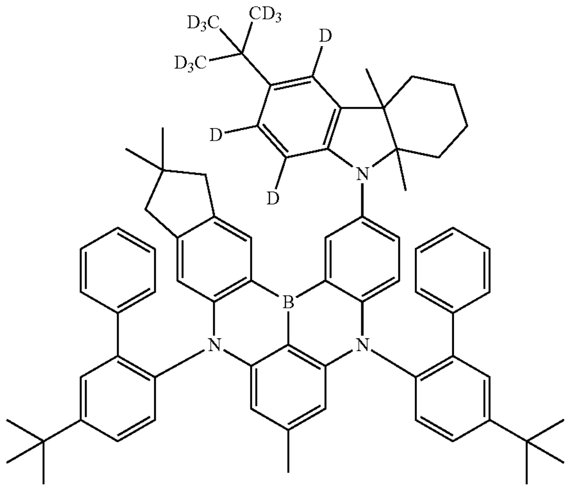
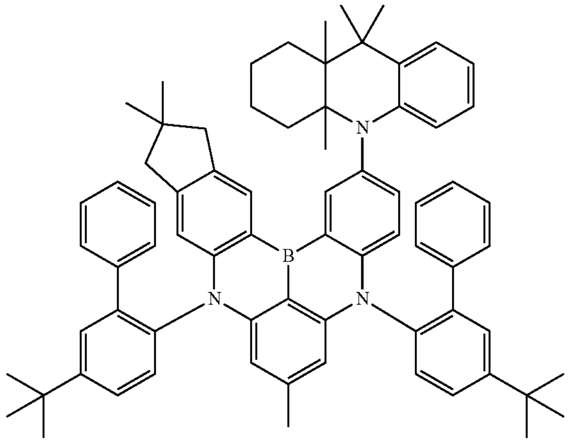
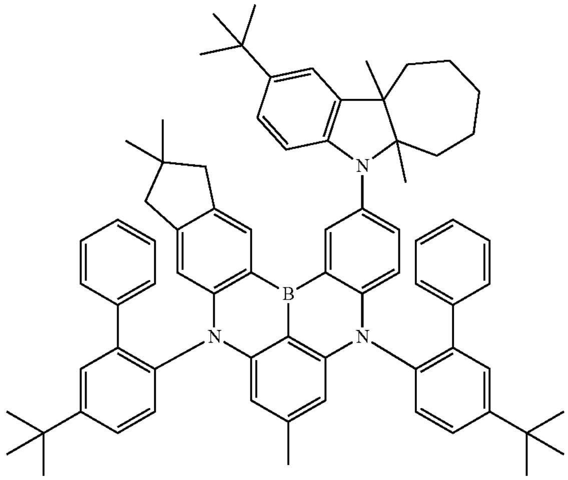
-continued
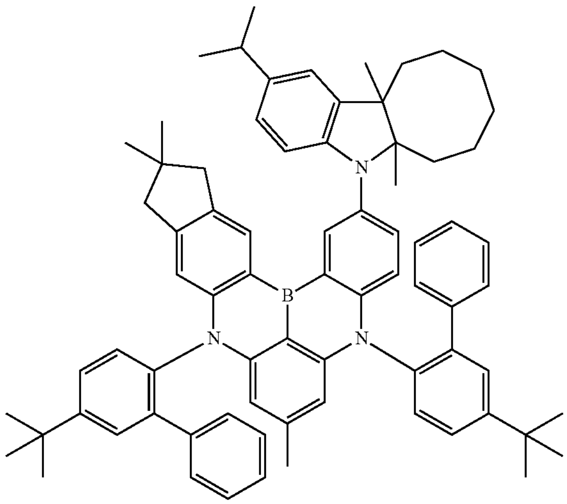
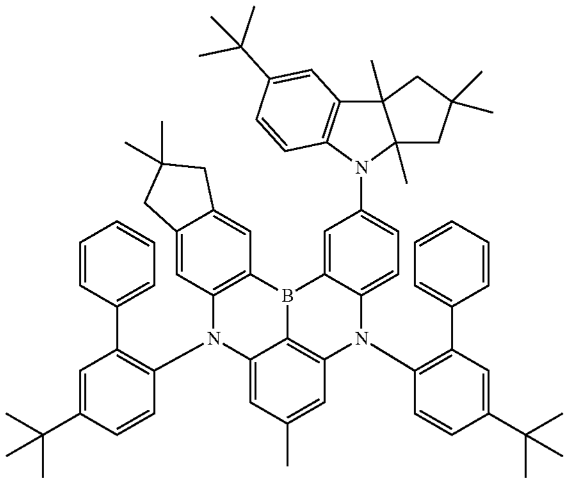
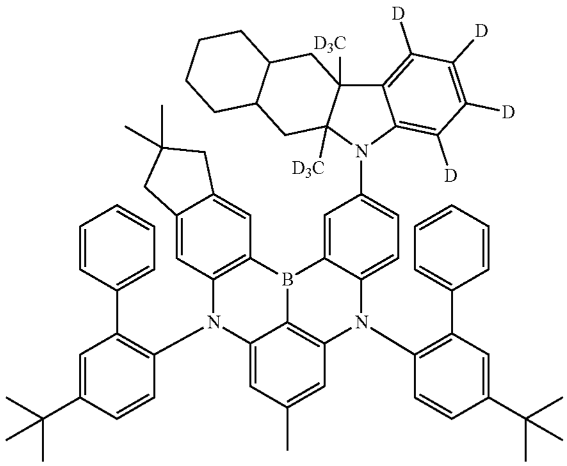

-continued
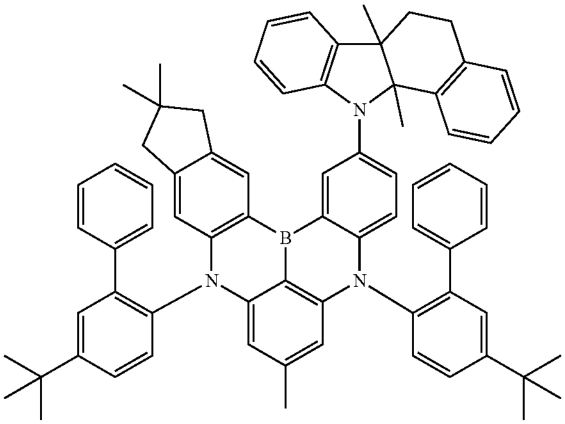
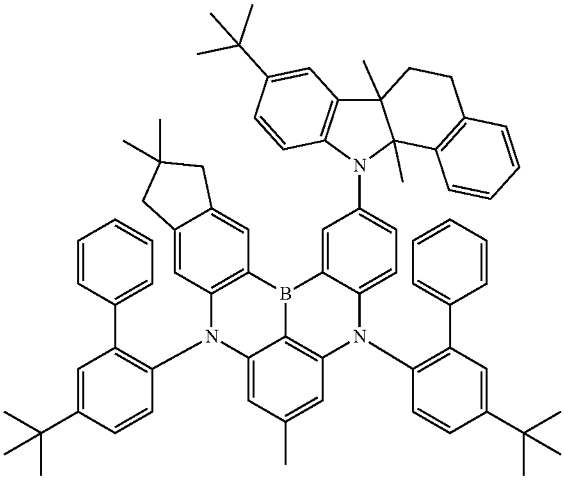
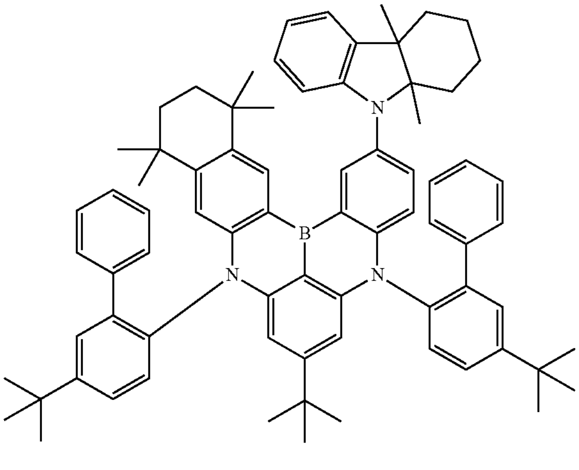
-continued
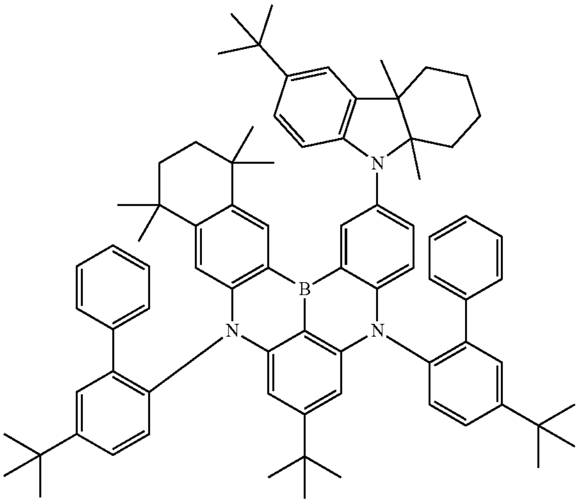
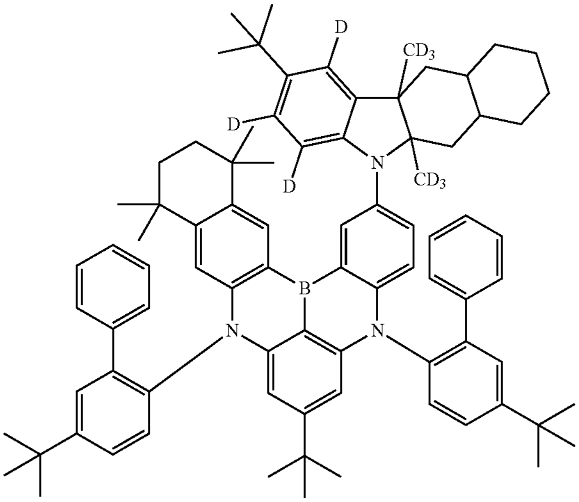
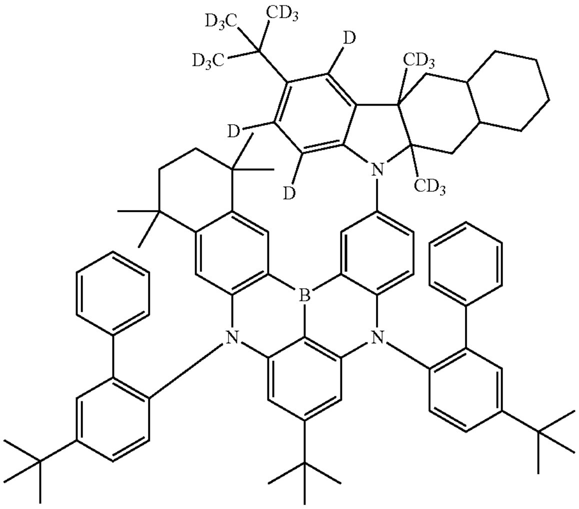

-continued
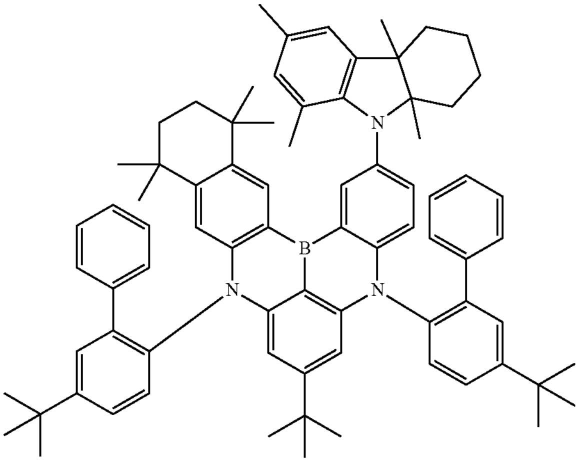
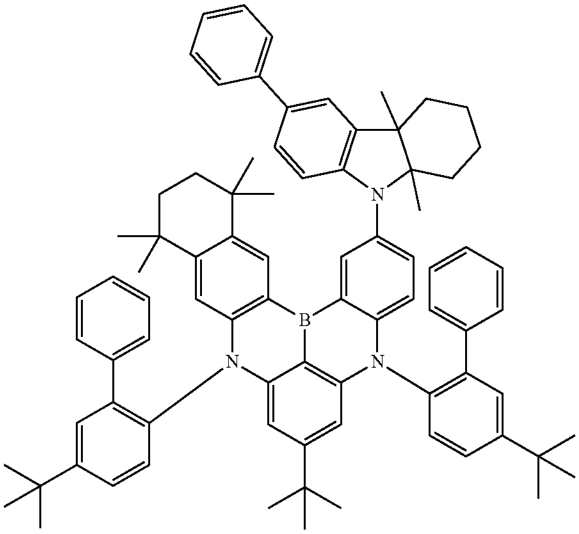
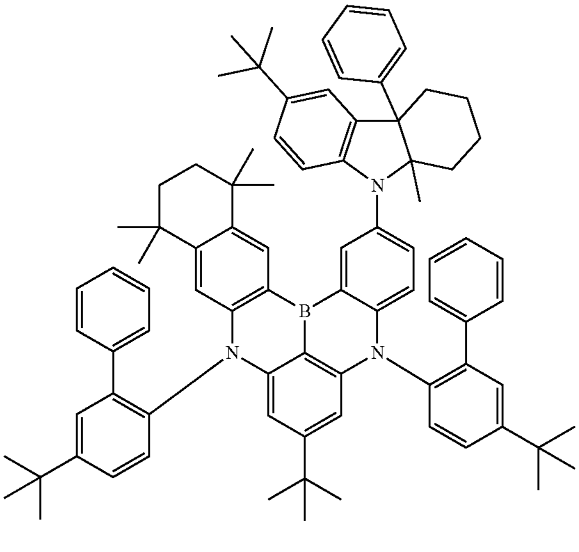
-continued
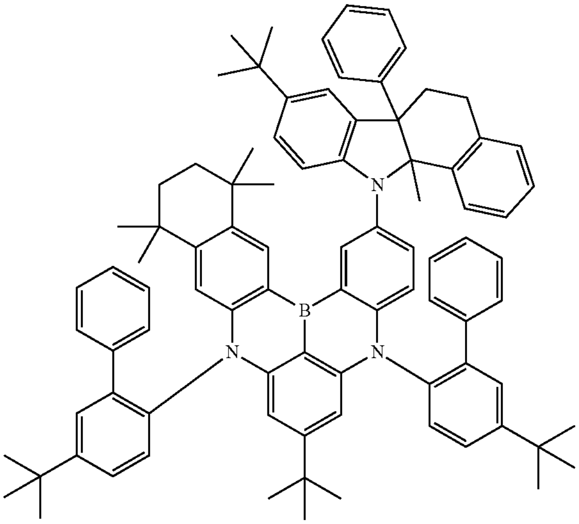
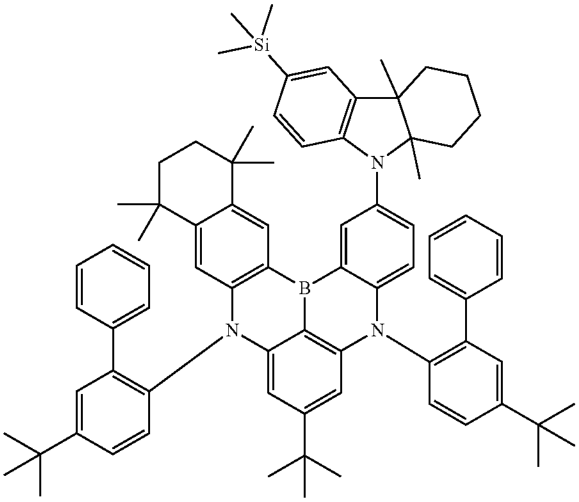
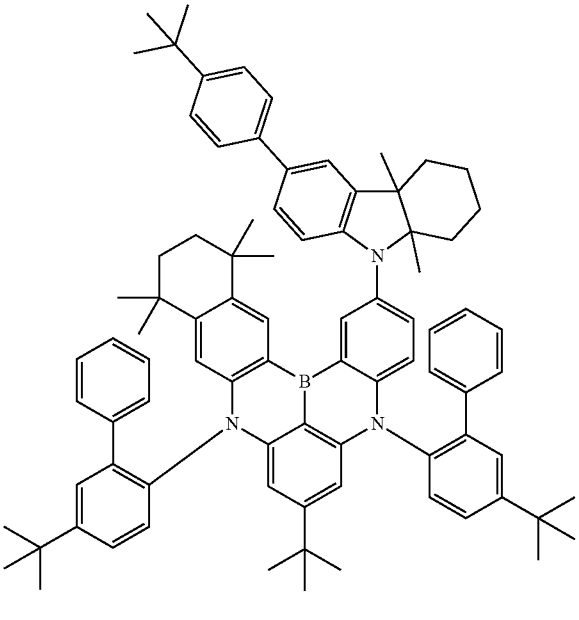

-continued
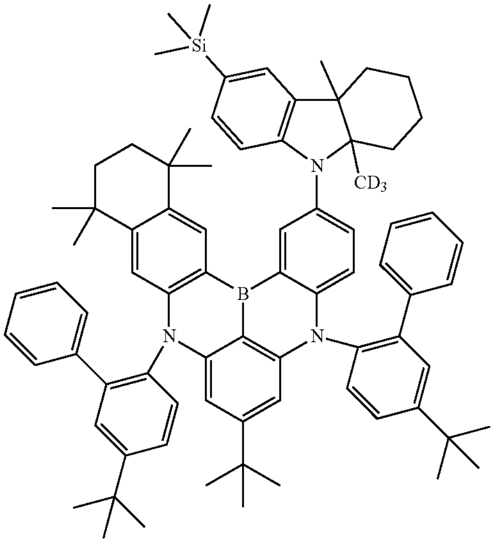
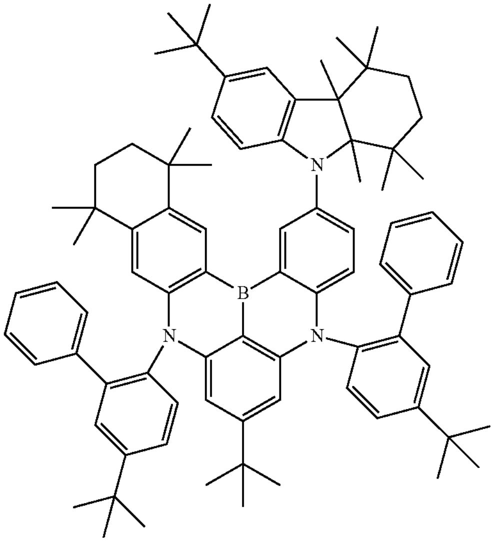
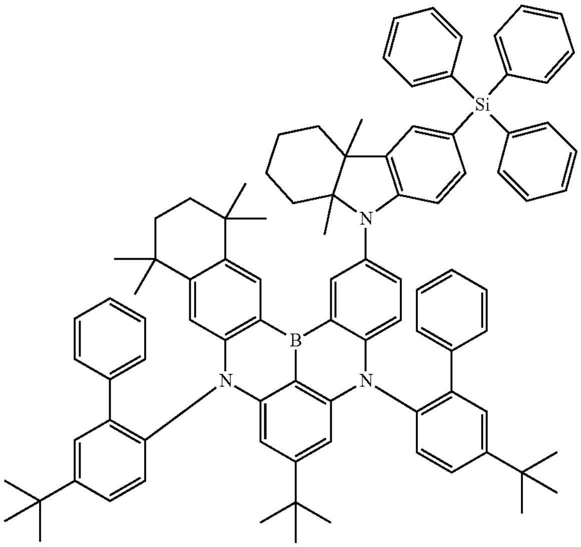
-continued
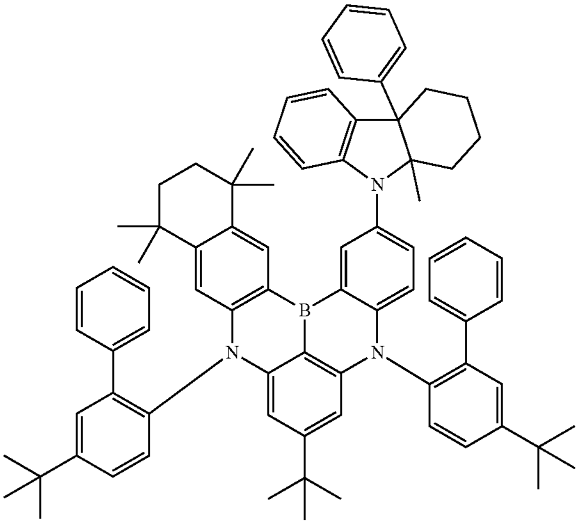
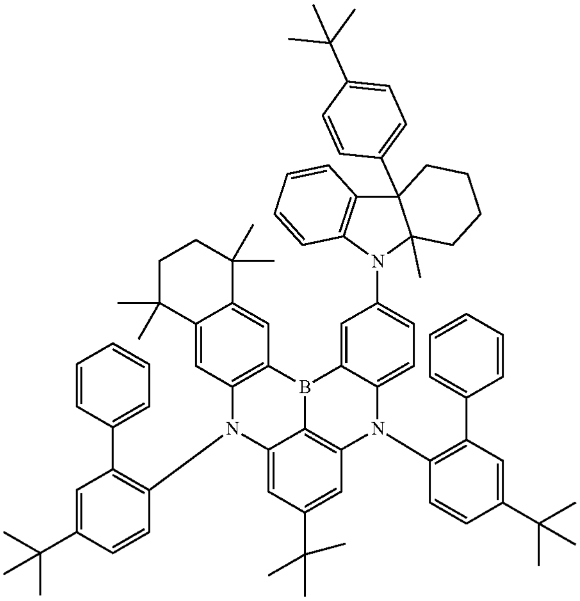
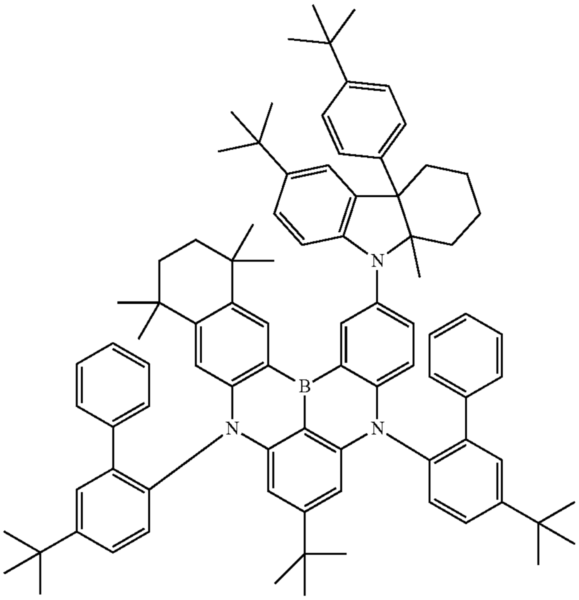

-continued
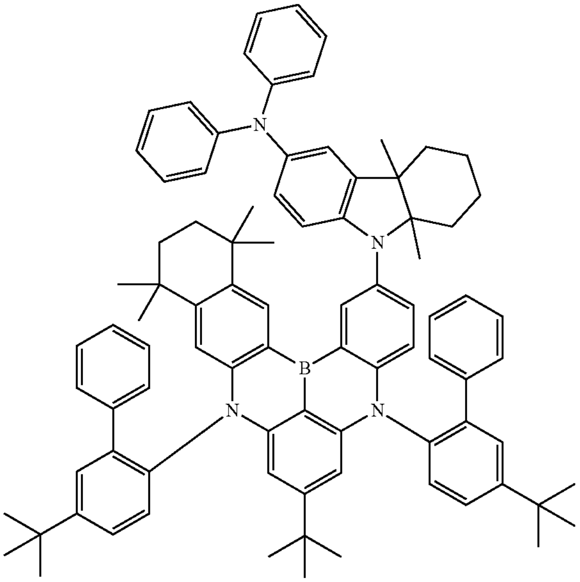
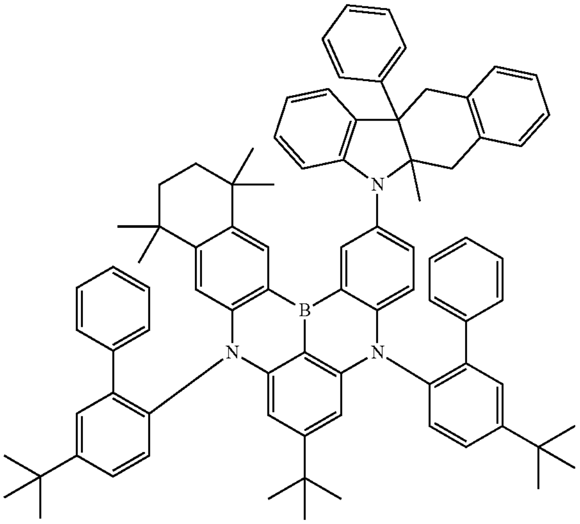
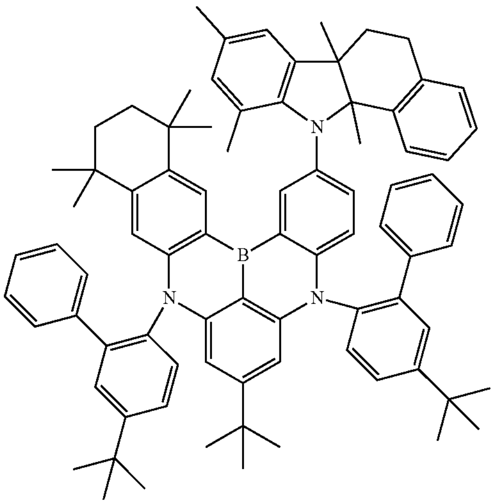
-continued
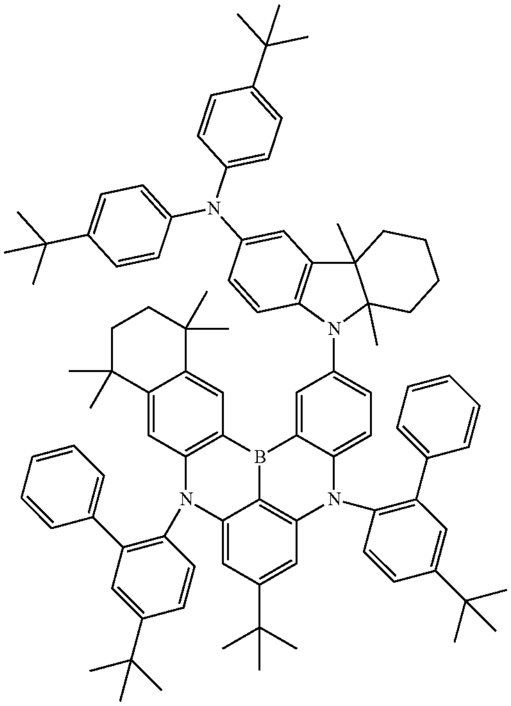
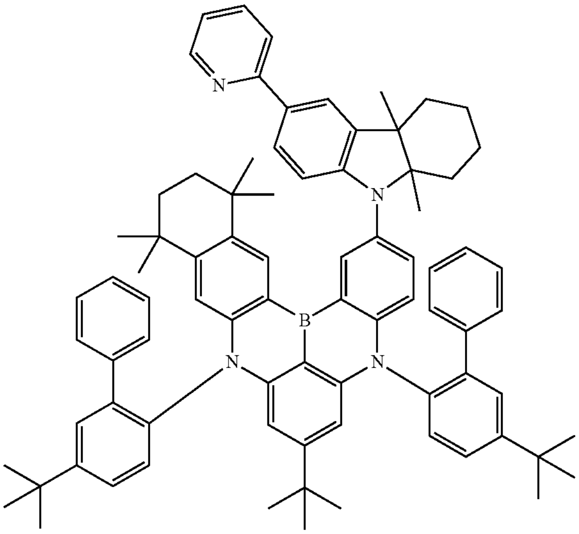

-continued
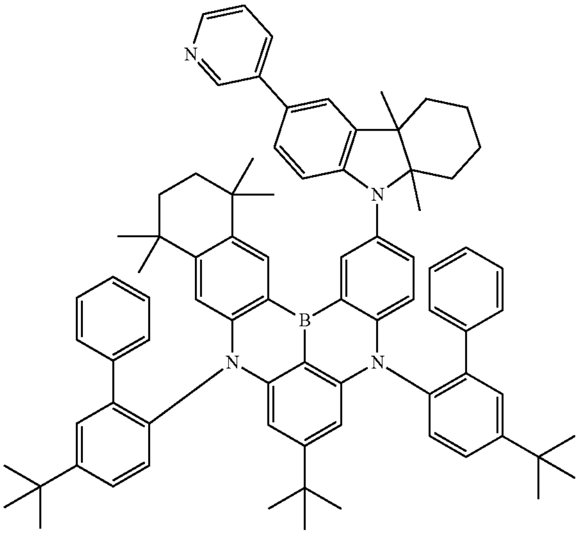
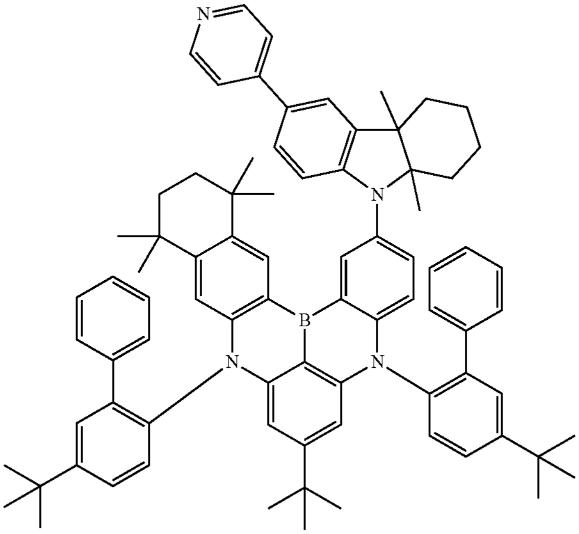
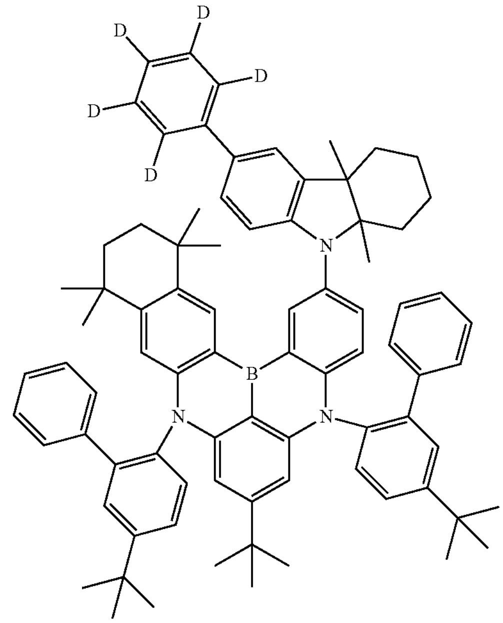
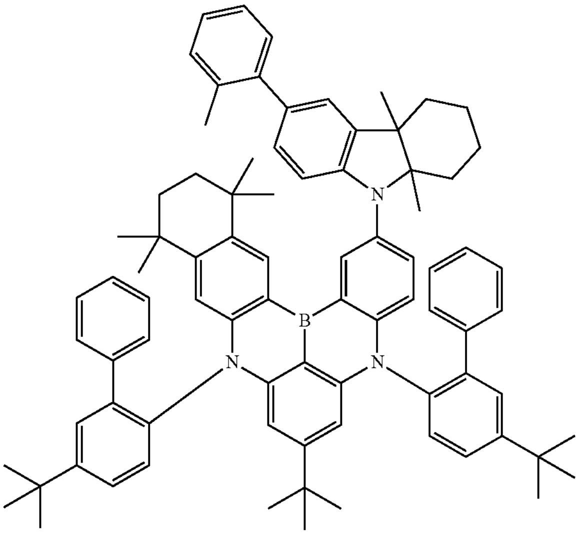
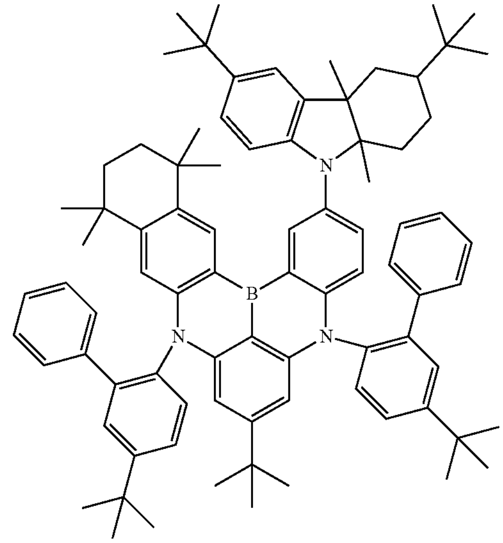
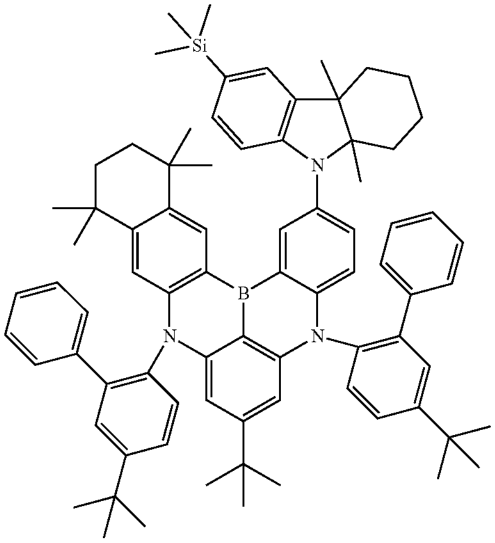

-continued
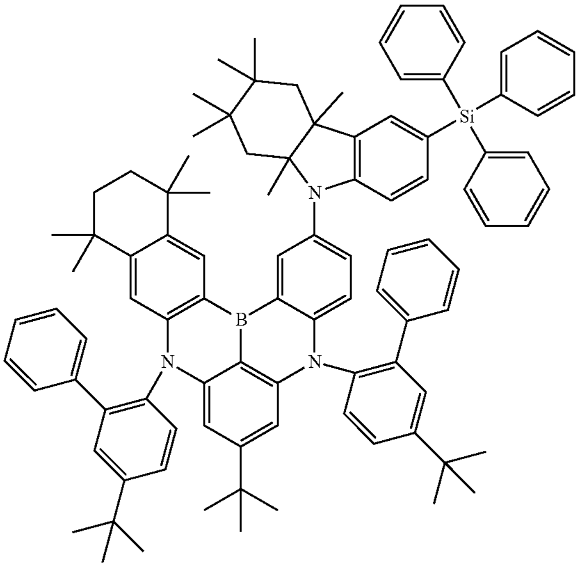
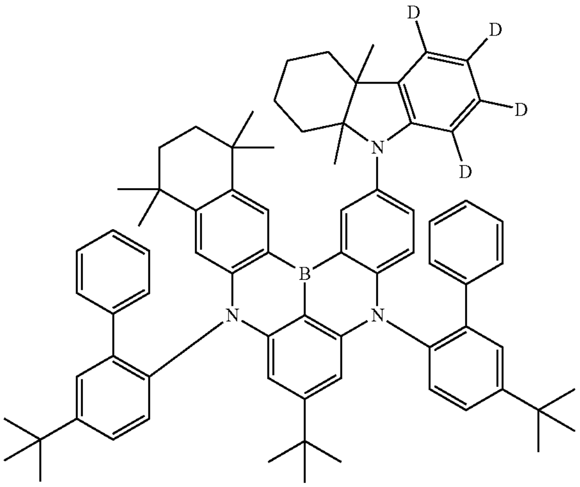
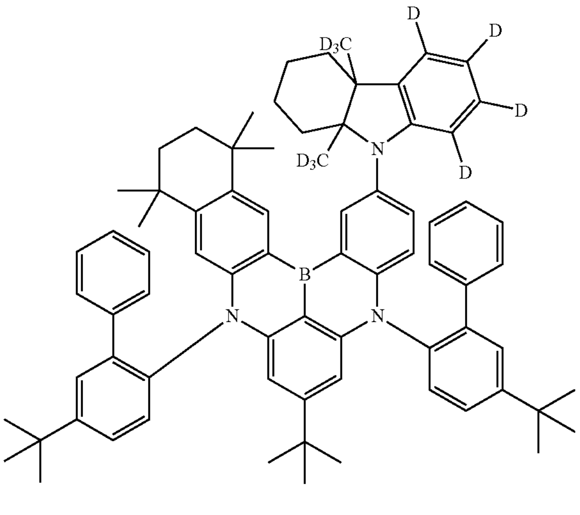
-continued
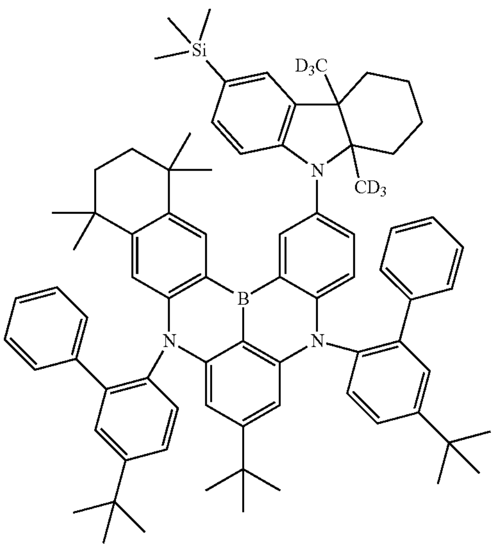
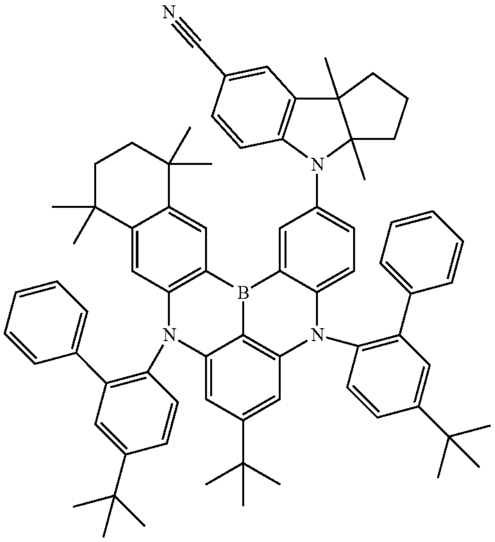
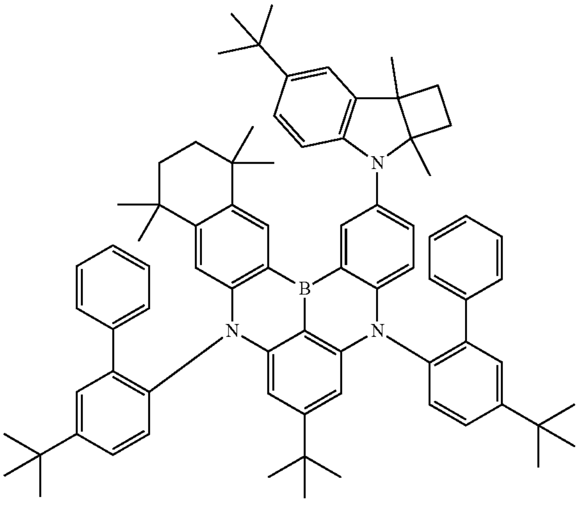

-continued
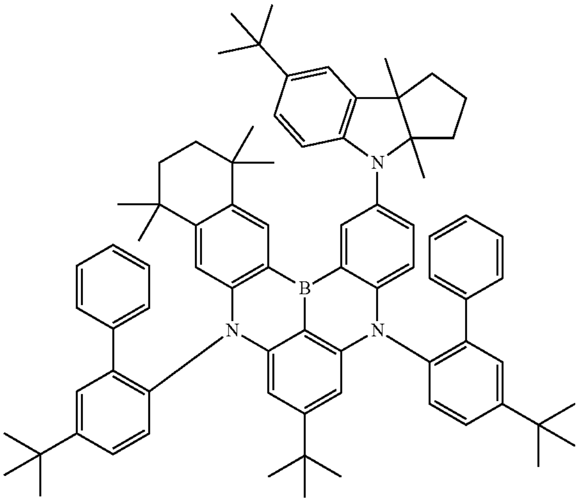
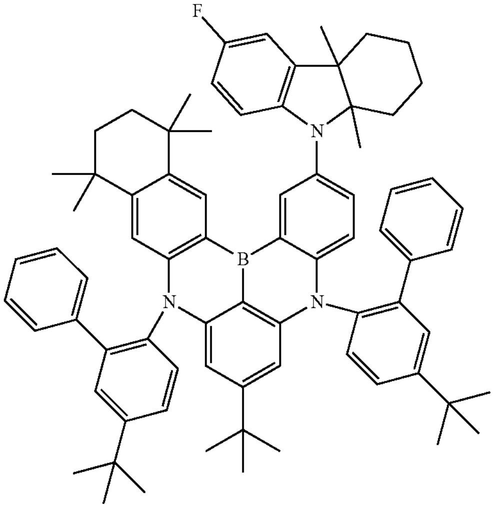
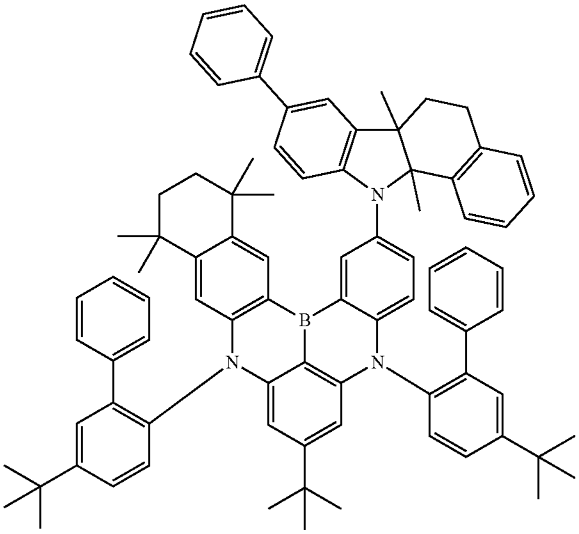
-continued
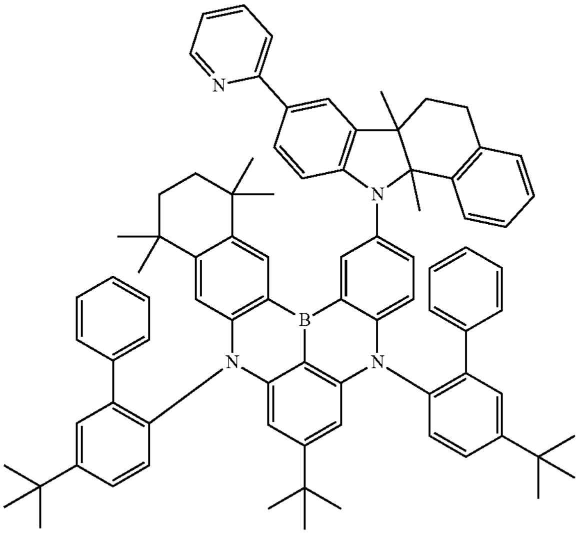
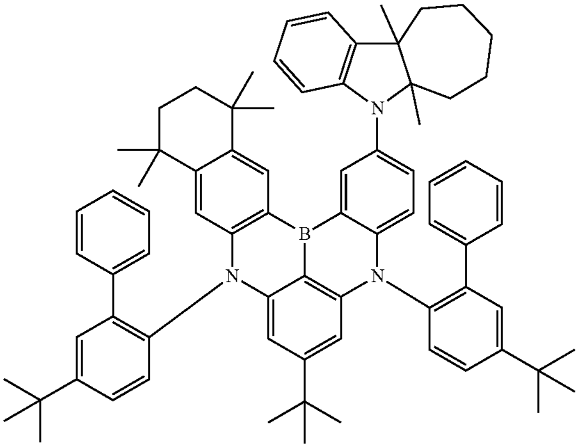
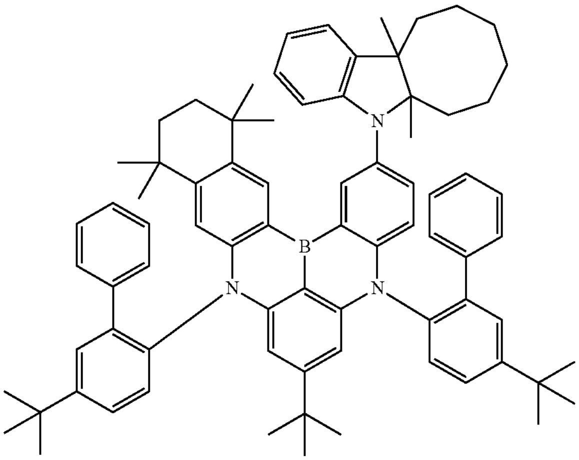

-continued
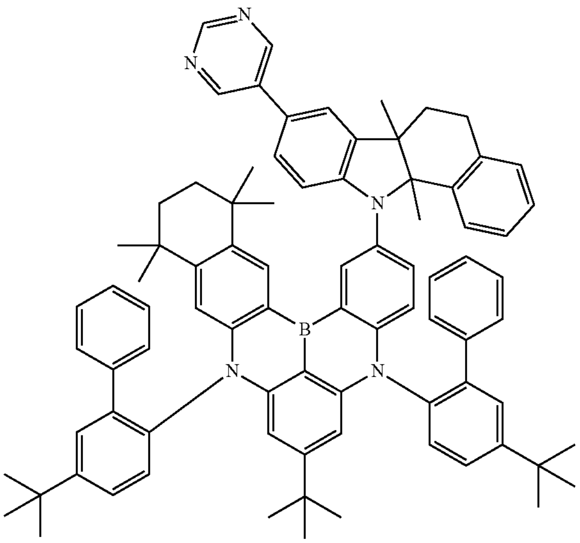
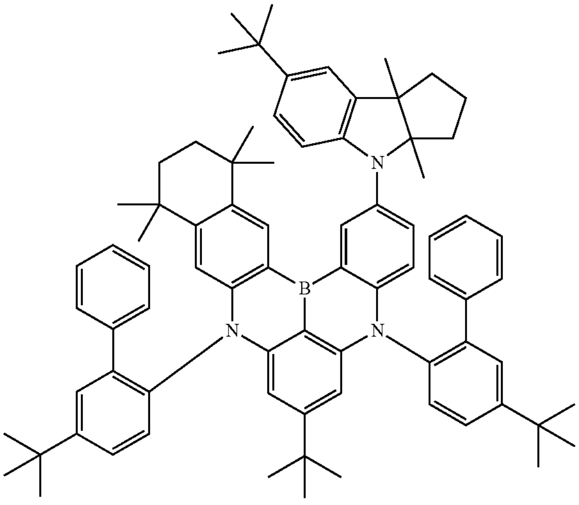
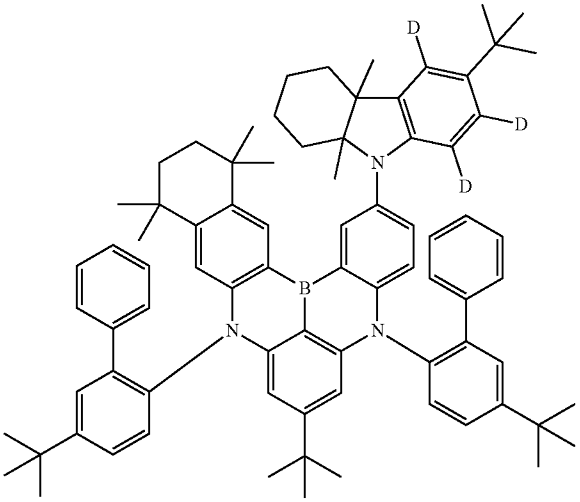
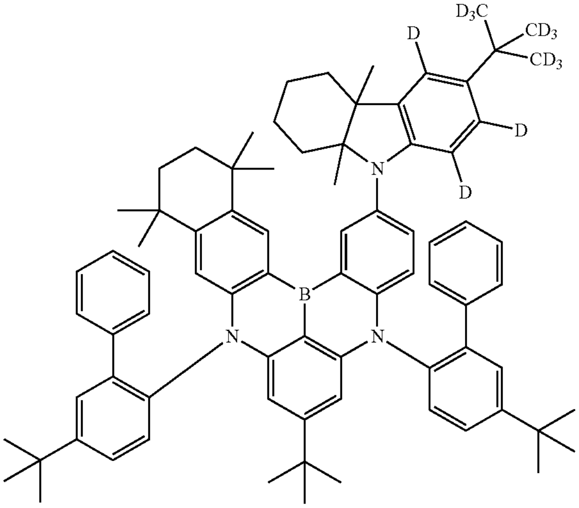
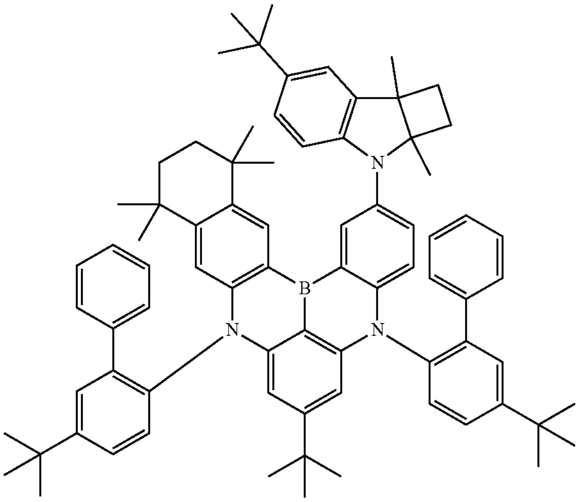
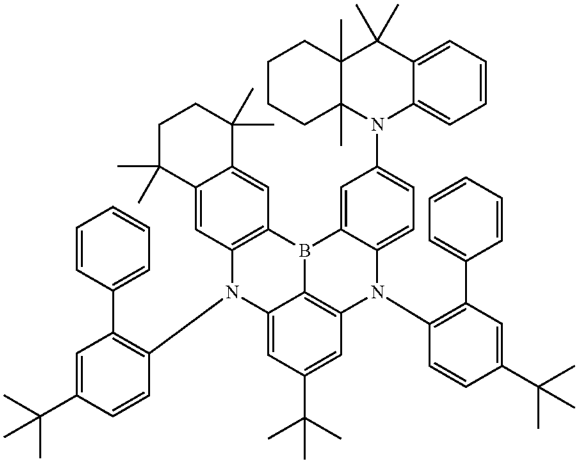

-continued
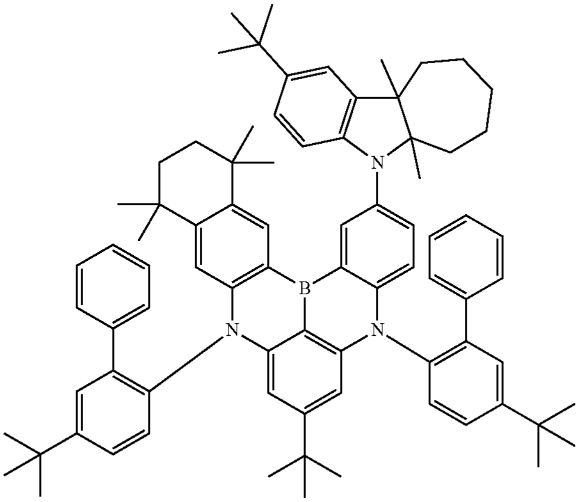
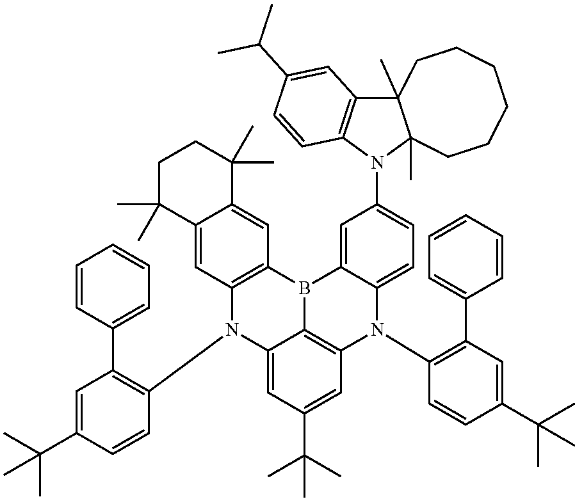
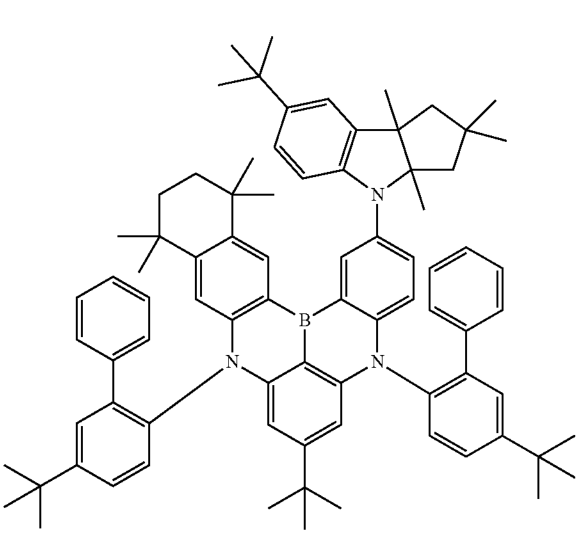
-continued
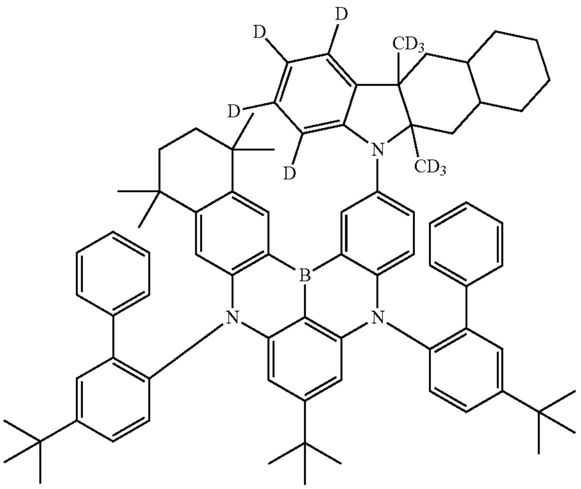
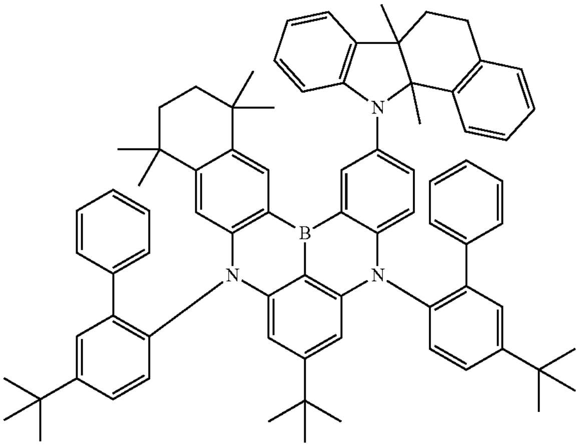
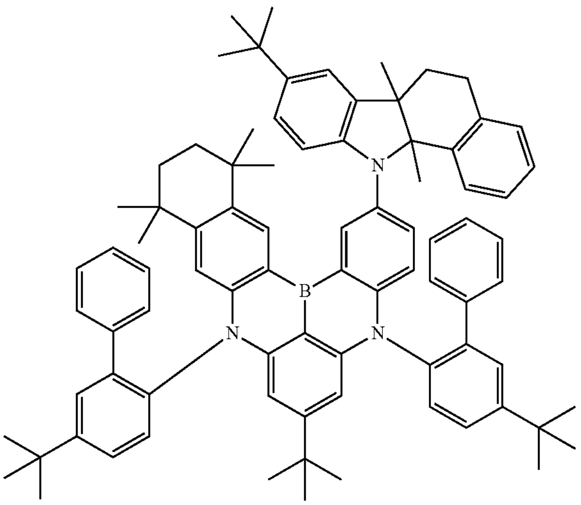

-continued
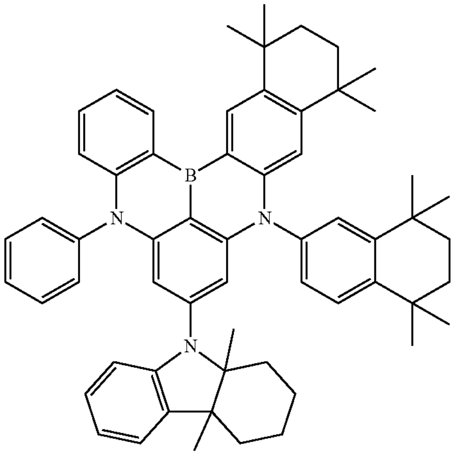
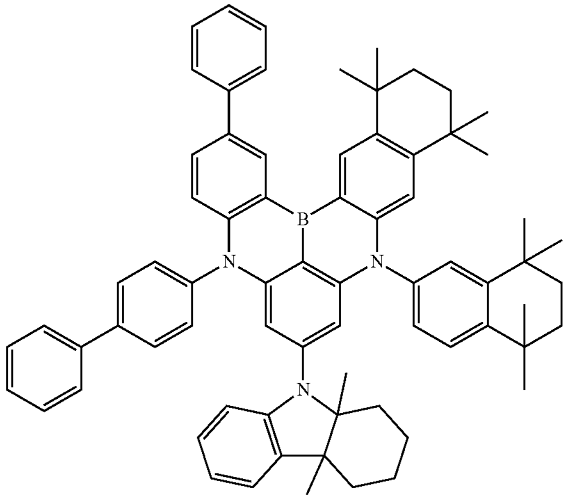
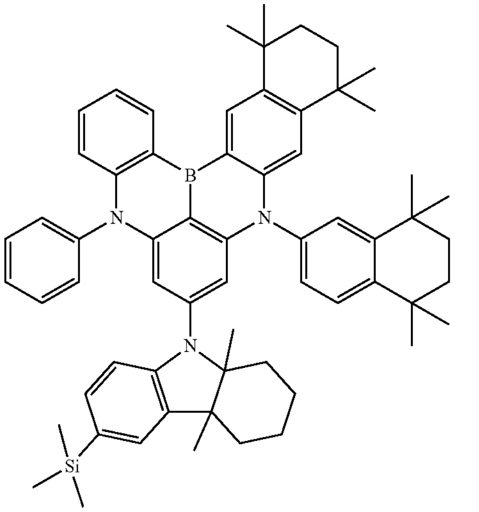
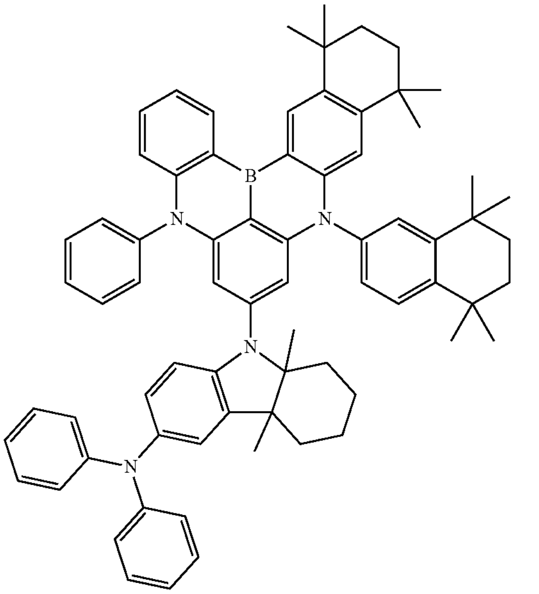
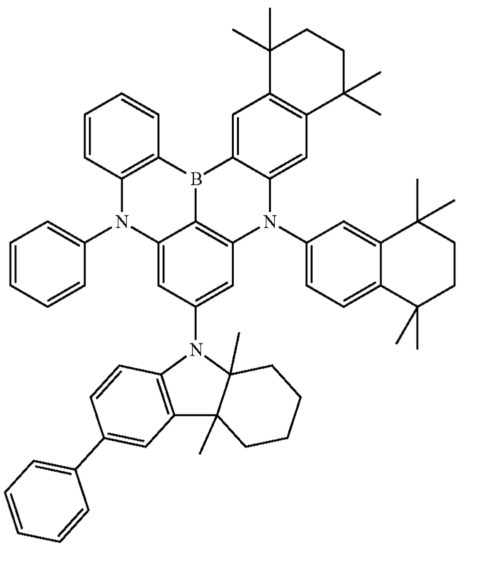
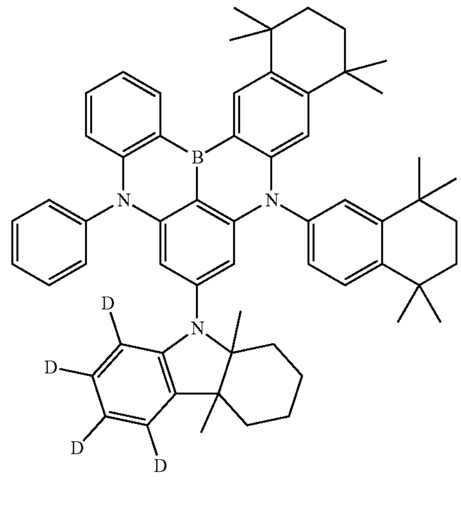

-continued
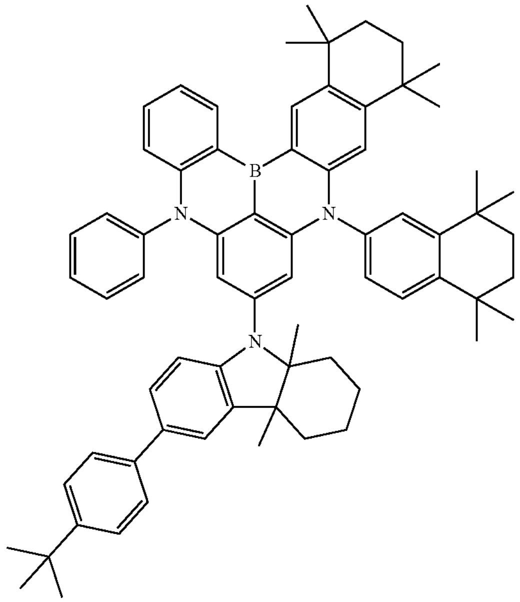
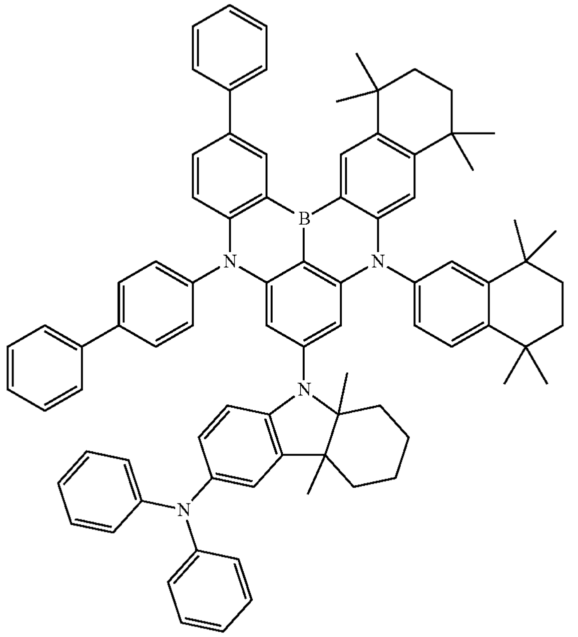
-continued
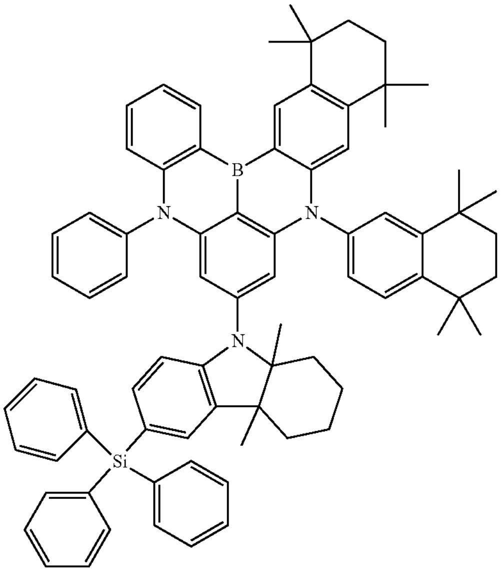
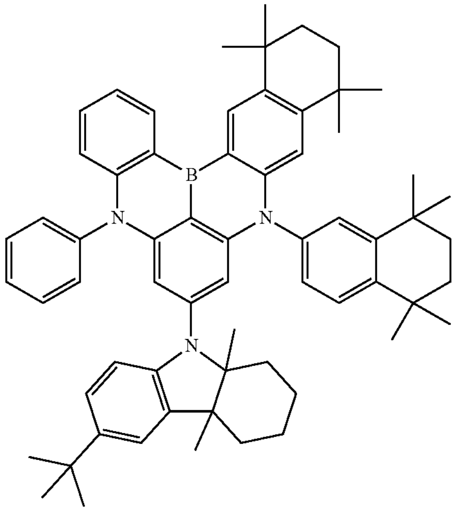
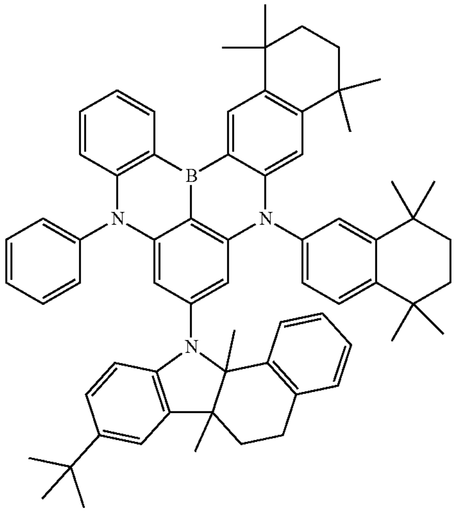

-continued
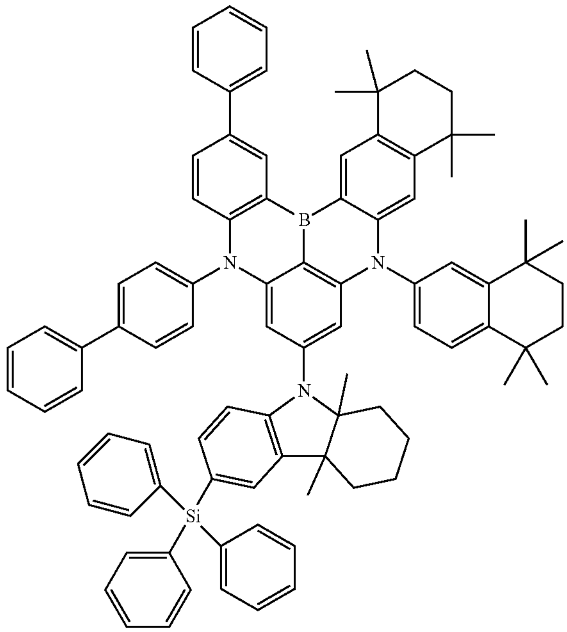
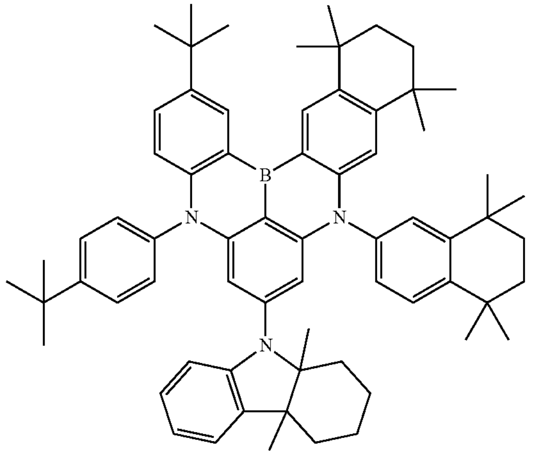
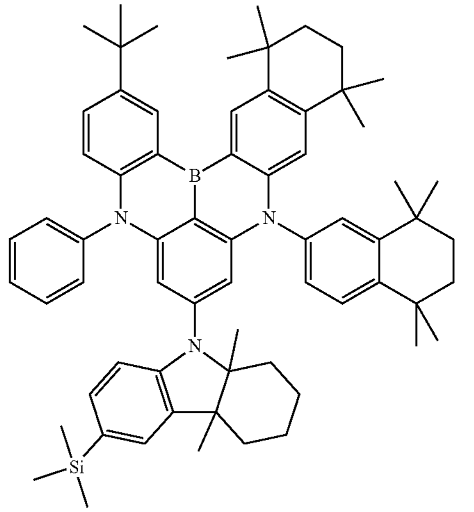
-continued
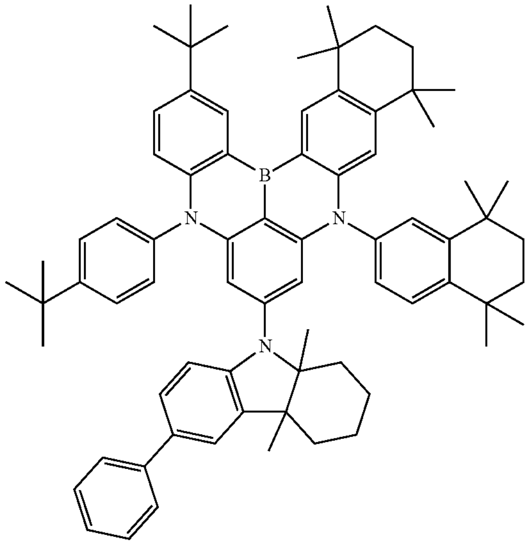
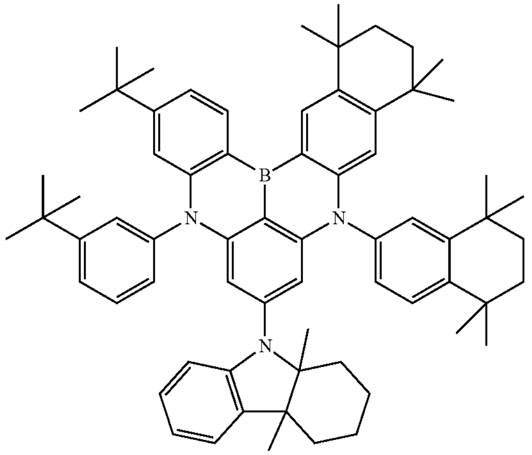 [SMILES: CC(C)(C)c1cccc(N2c3cc(C(C)(C)C)ccc3B3c4cc5c(cc4N(c4ccc6c(c4)C(C)(C)CCC6(C)C)c4cc(N6c7ccccc7C7(C)CCCCC67C)cc2c43)C(C)(C)CCC5(C)C)c1]
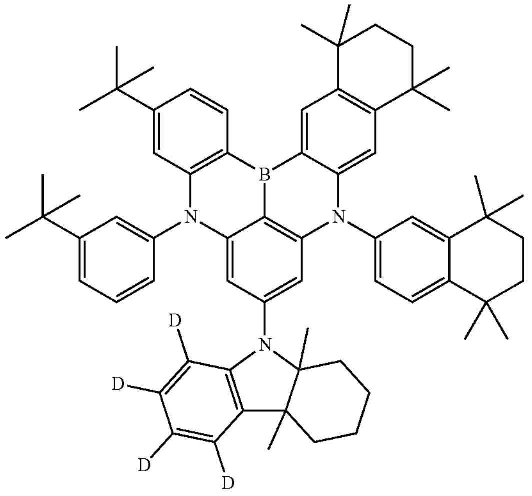

-continued
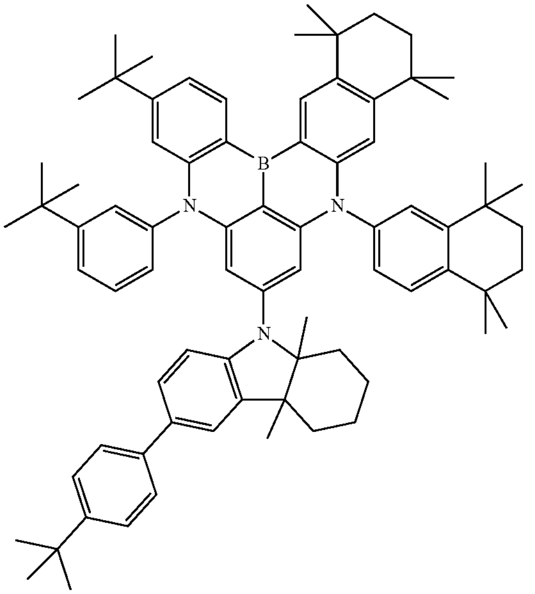
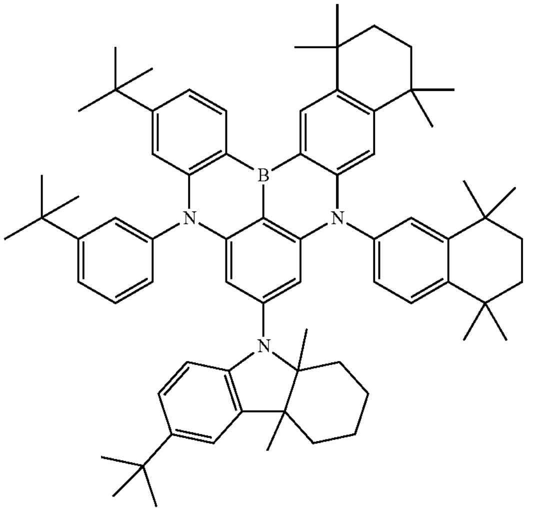
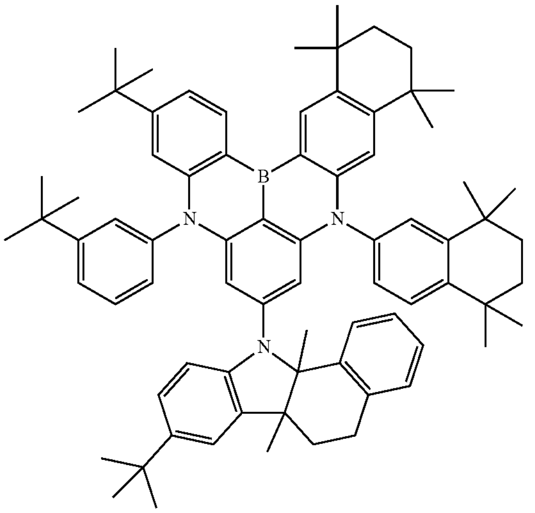
-continued
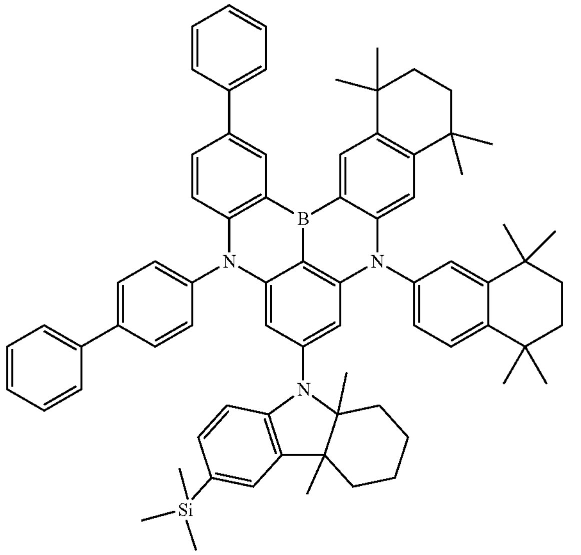
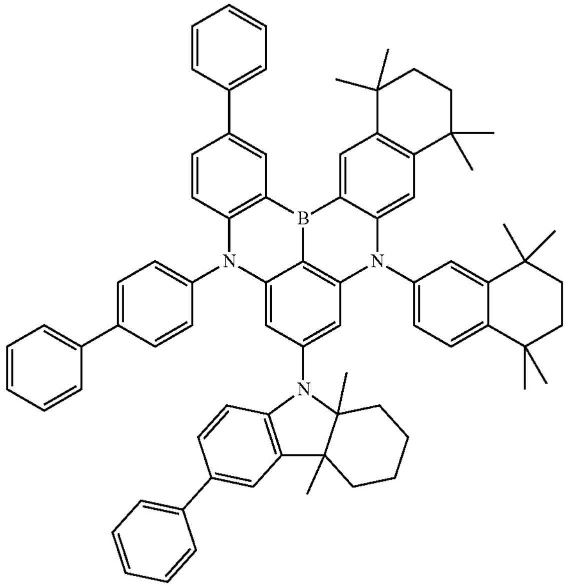
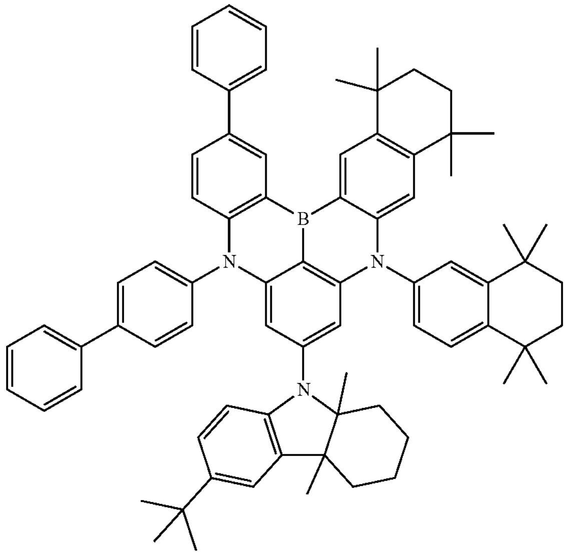

-continued
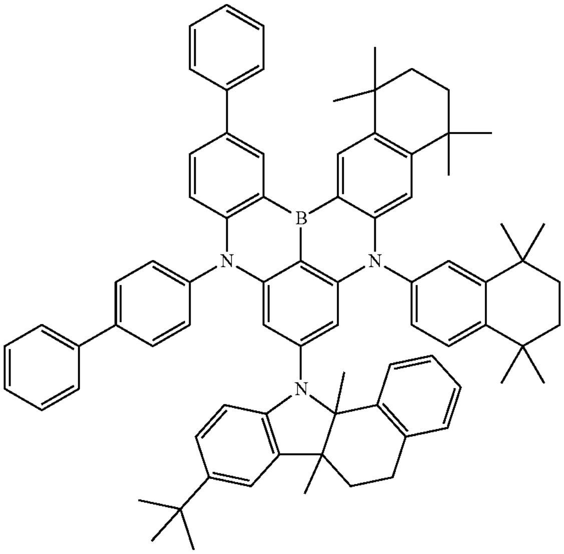
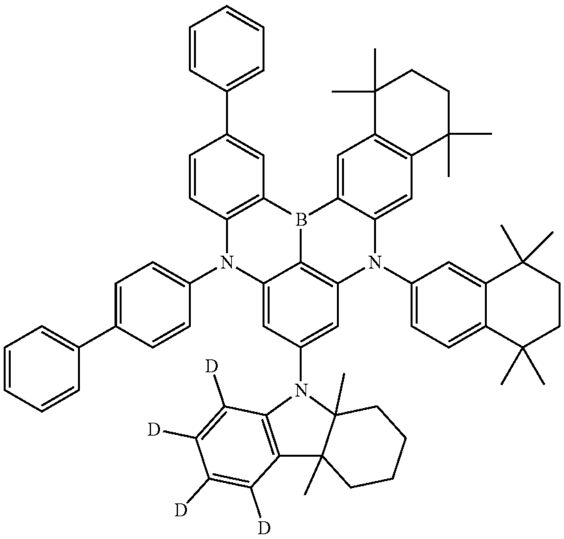
-continued
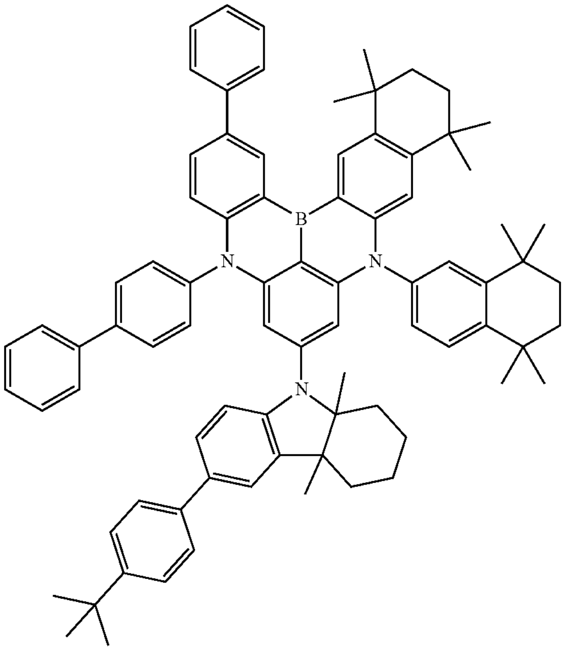
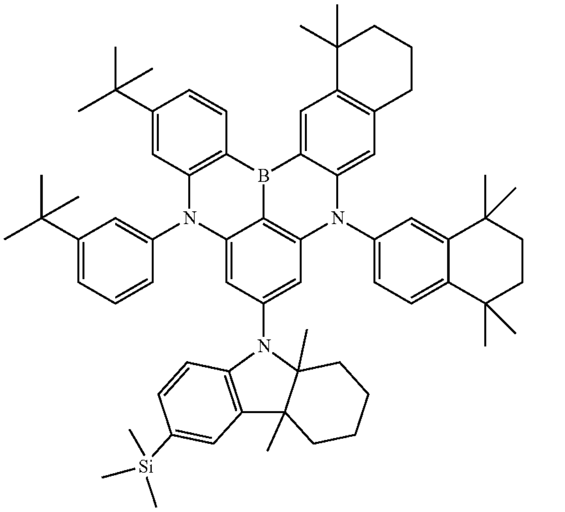
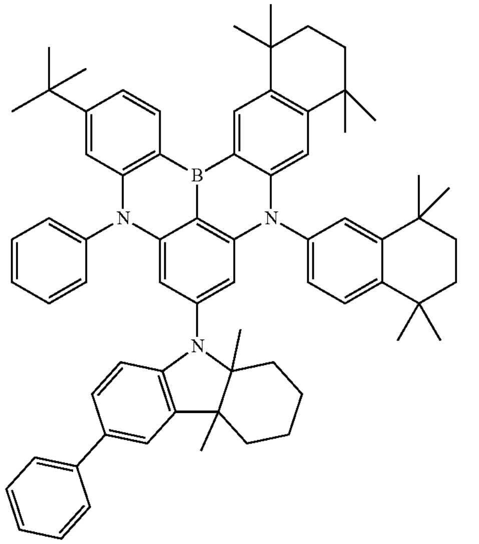

-continued
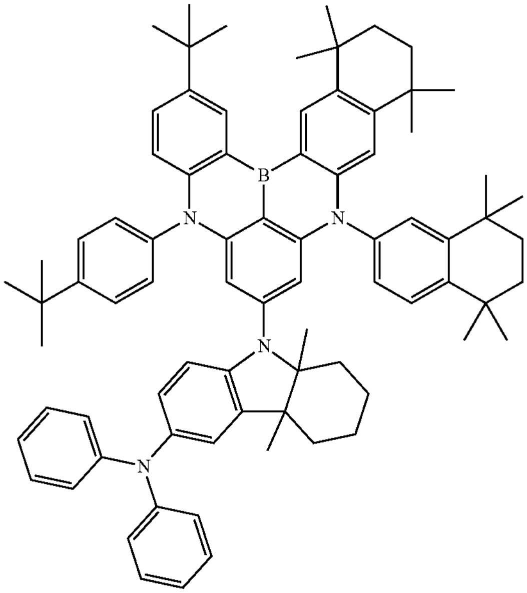
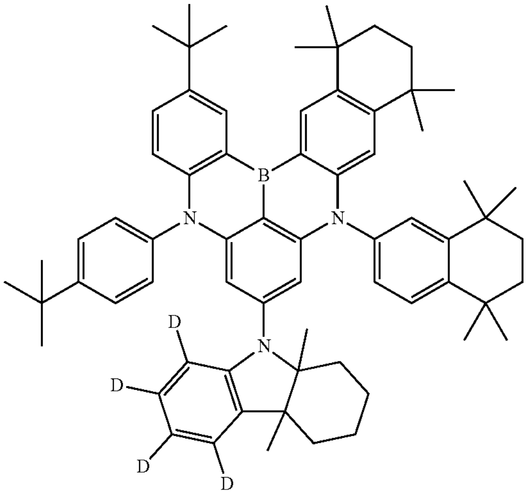
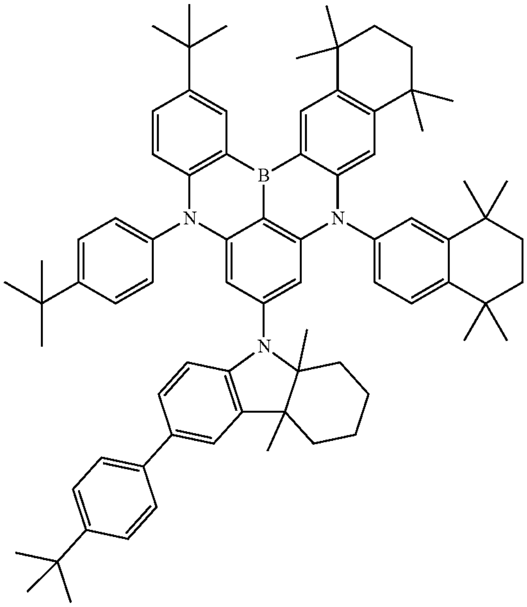
-continued
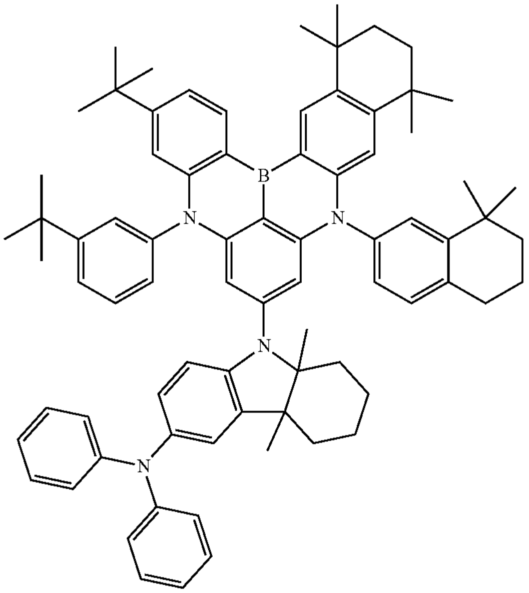
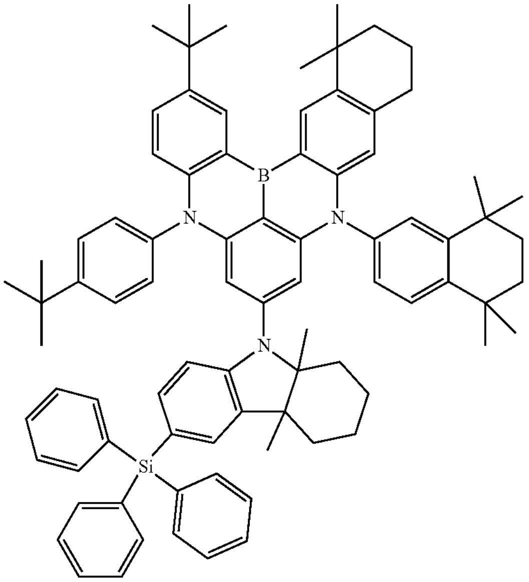
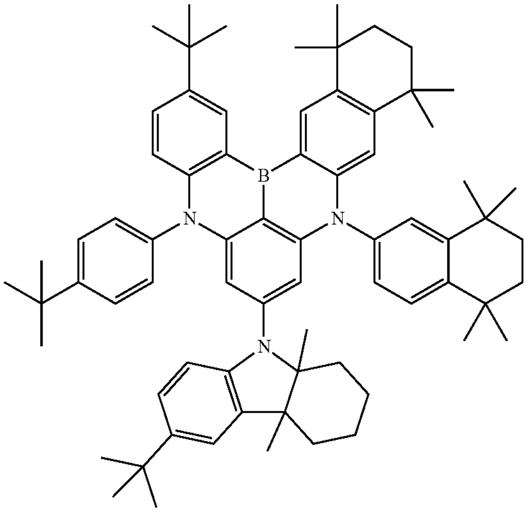

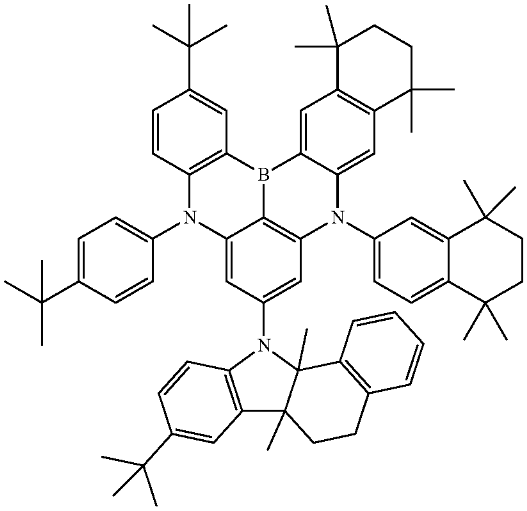
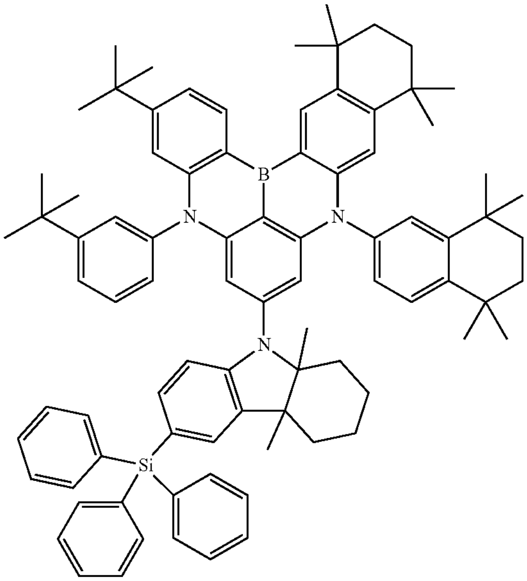
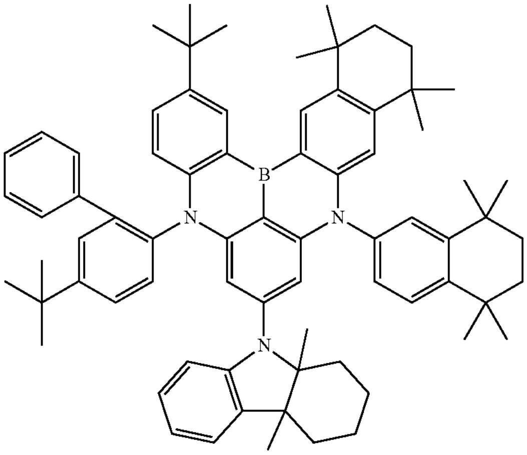
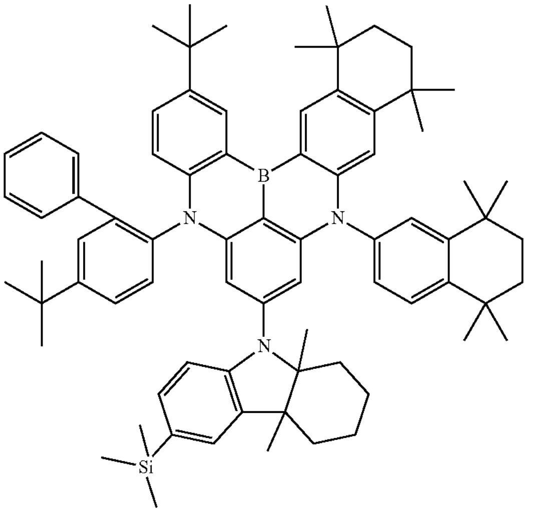
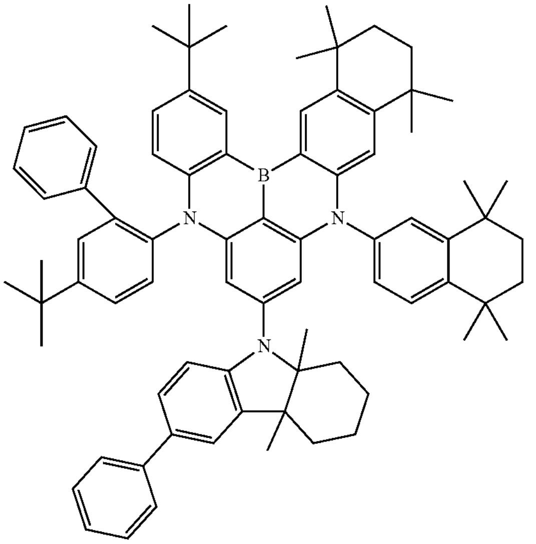
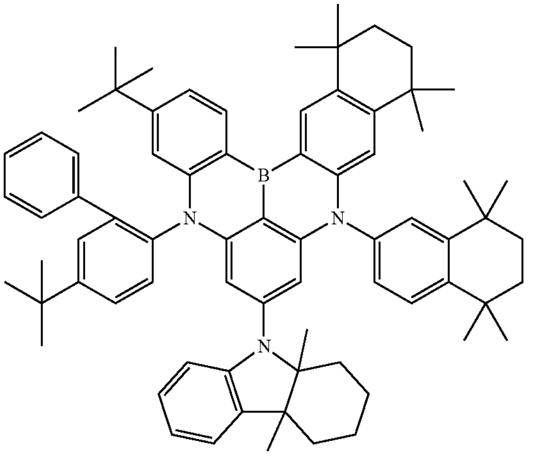

-continued
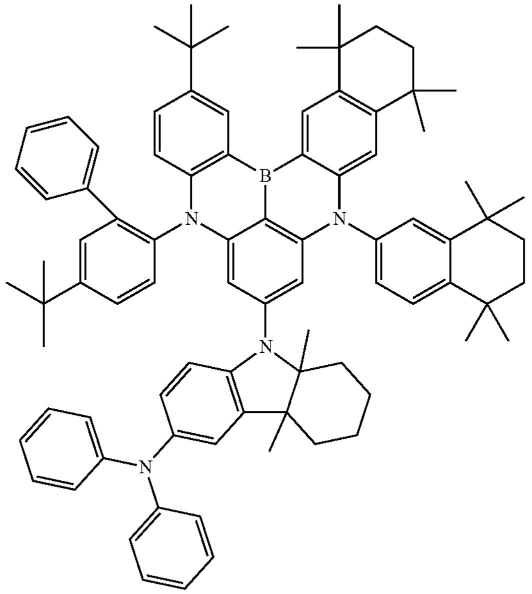
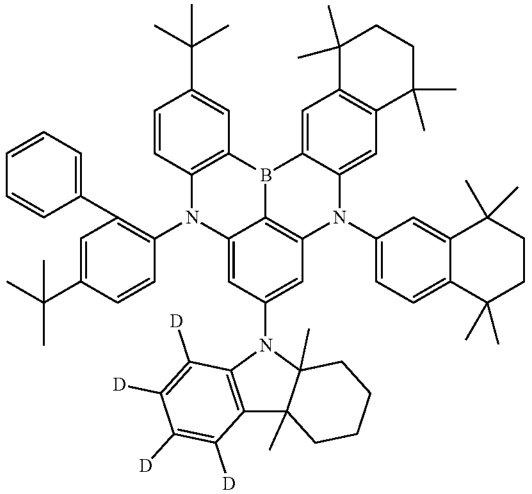
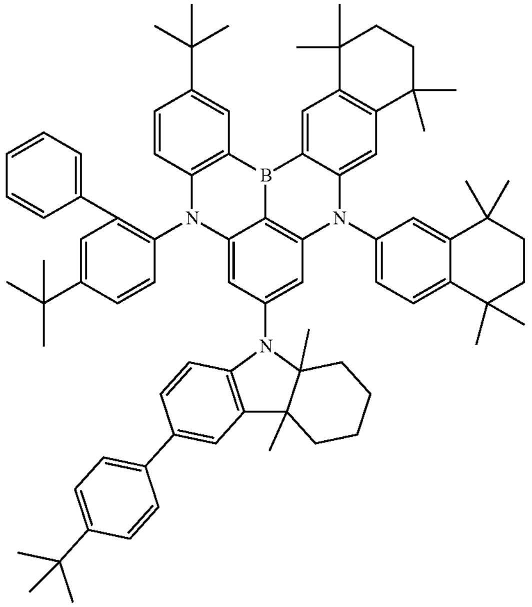
-continued
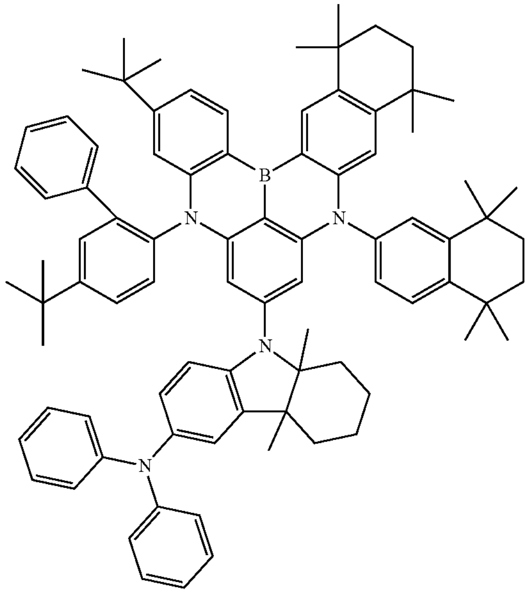
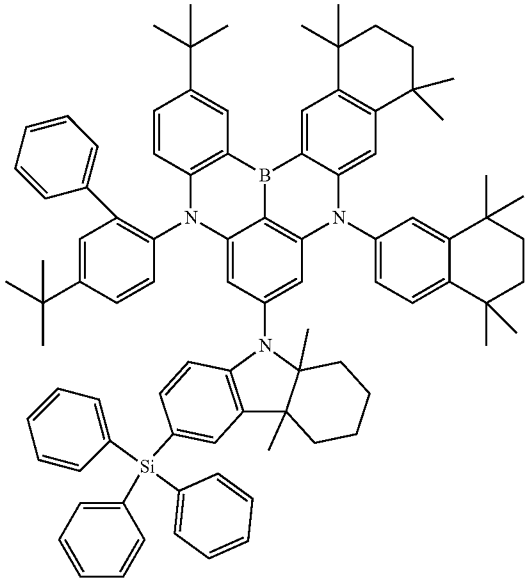
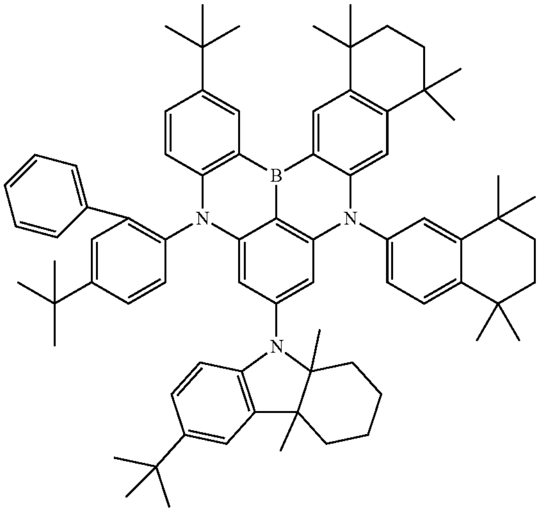

-continued
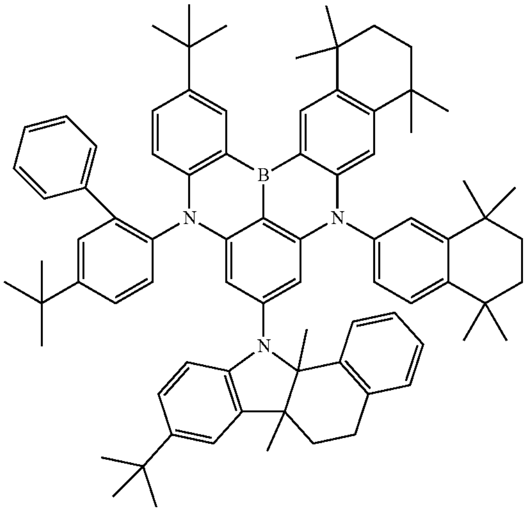
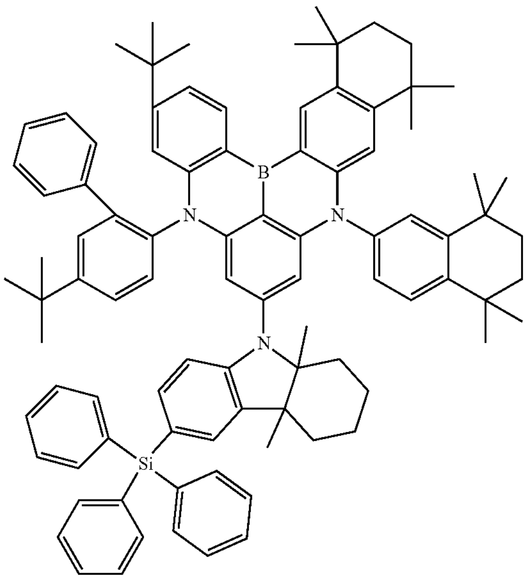
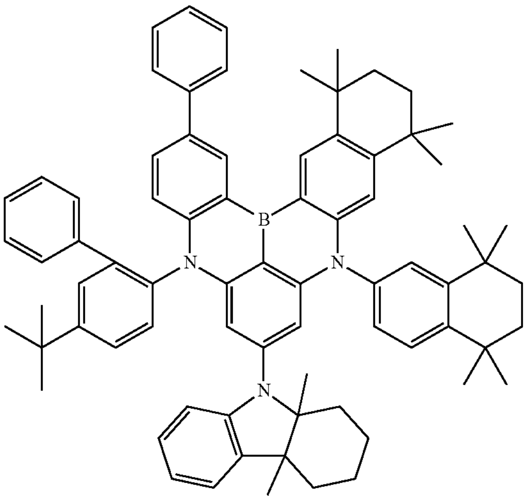
-continued
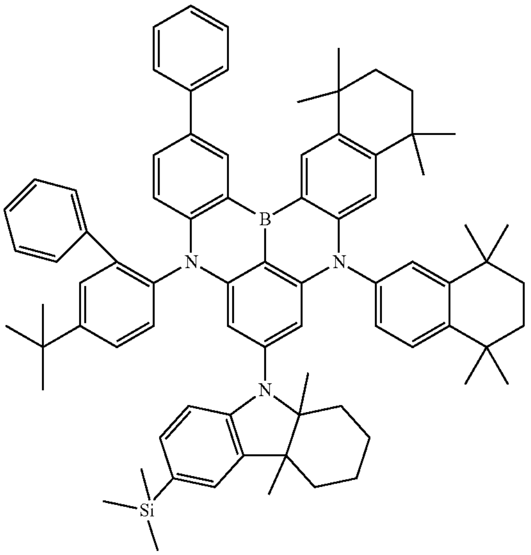
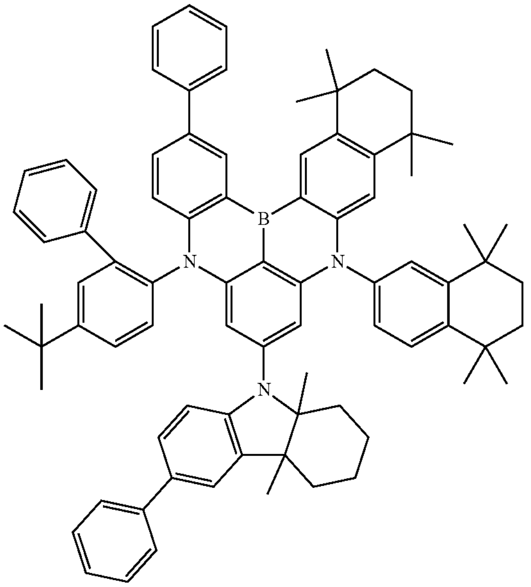
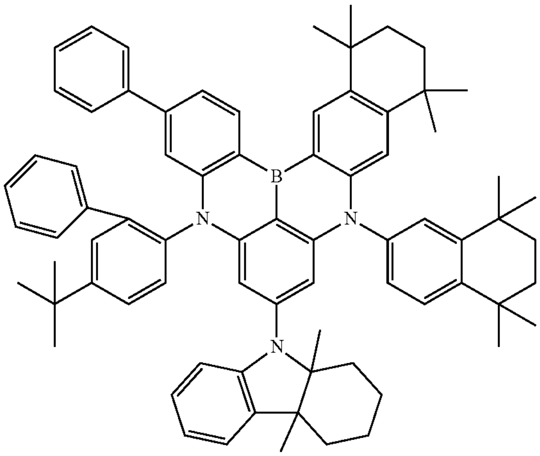

-continued
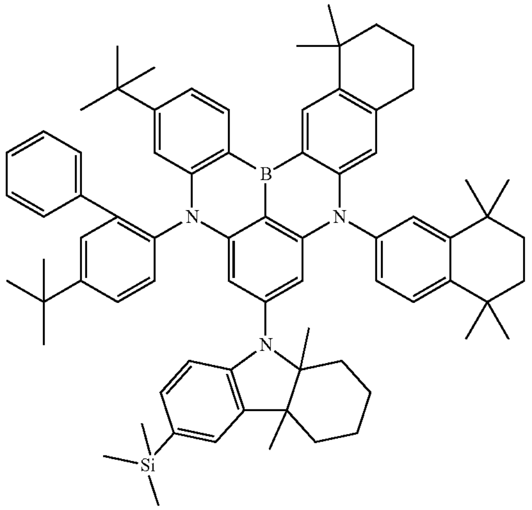
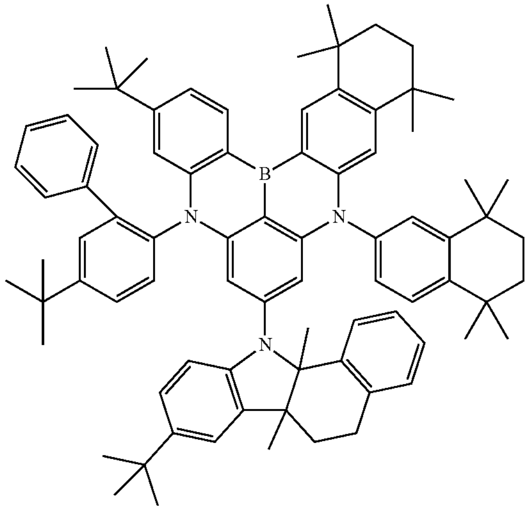
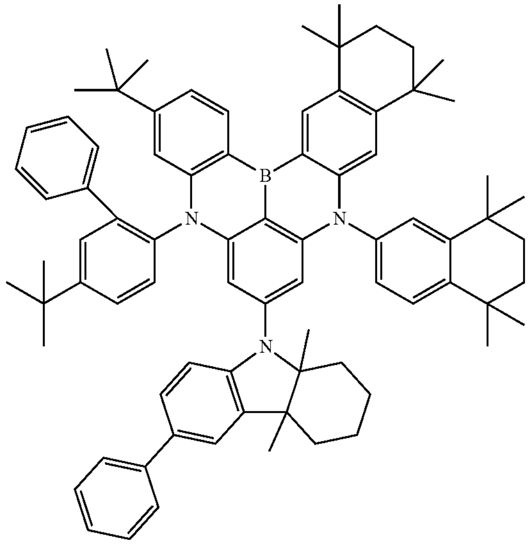
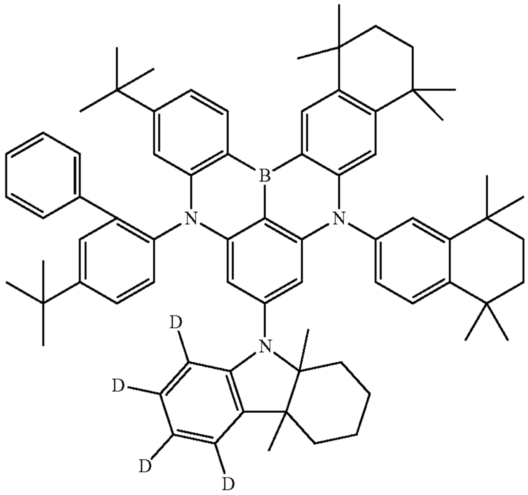
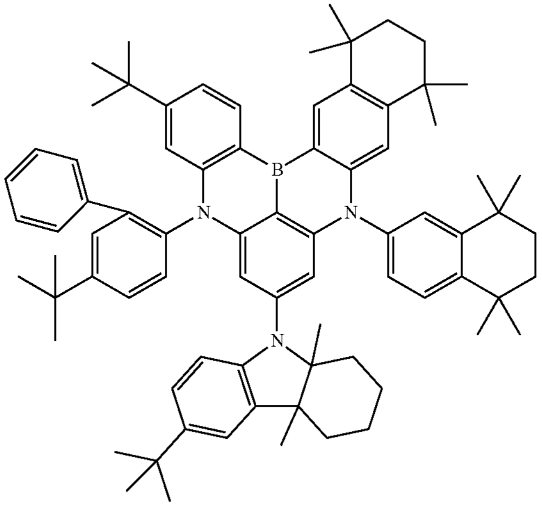
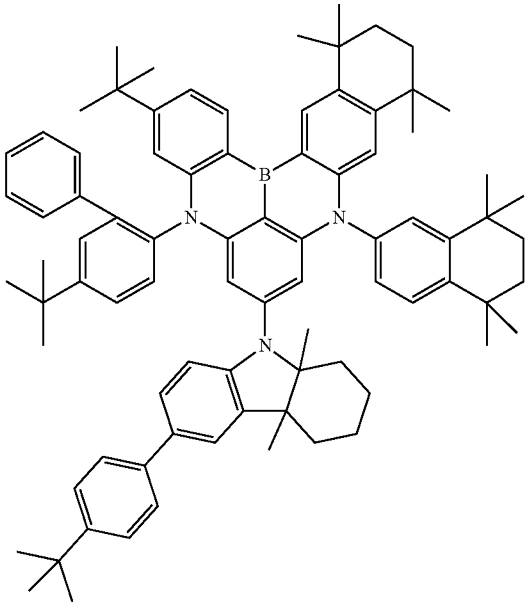

-continued
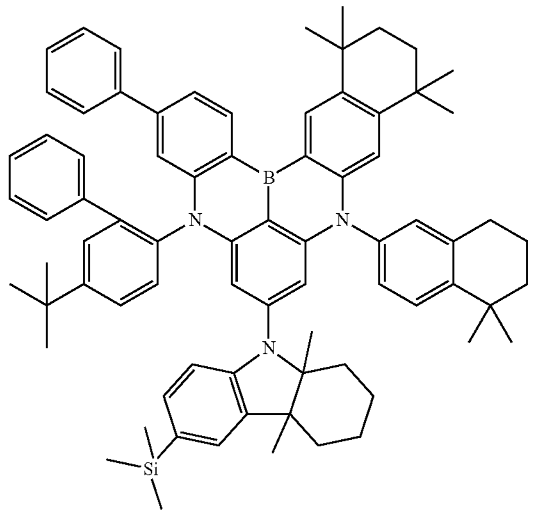
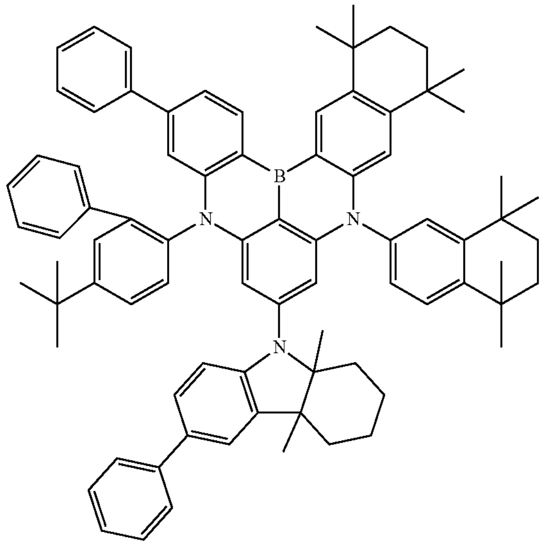
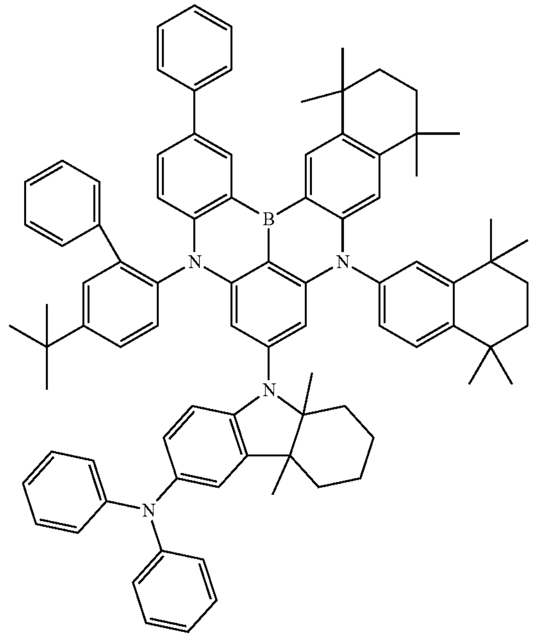
-continued
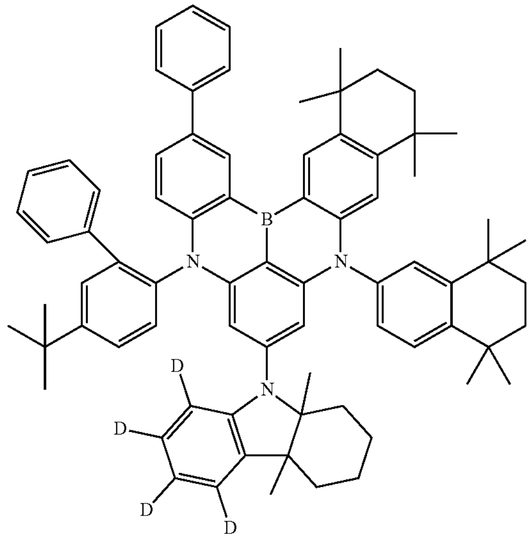
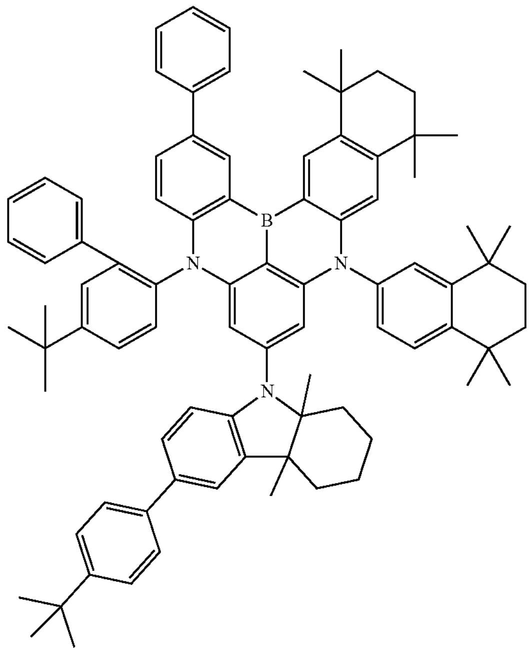

-continued
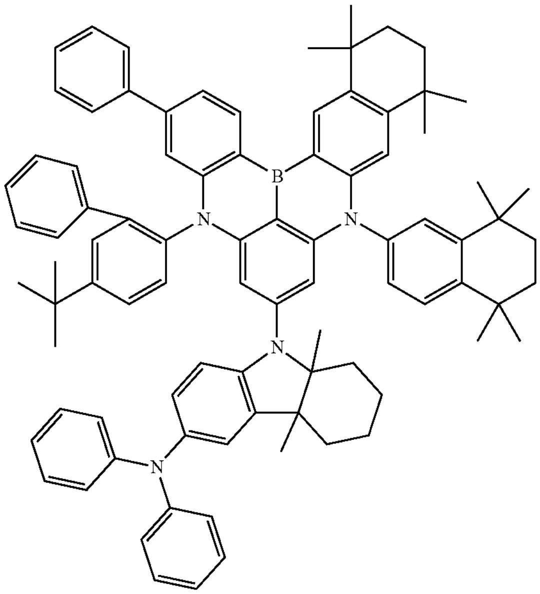
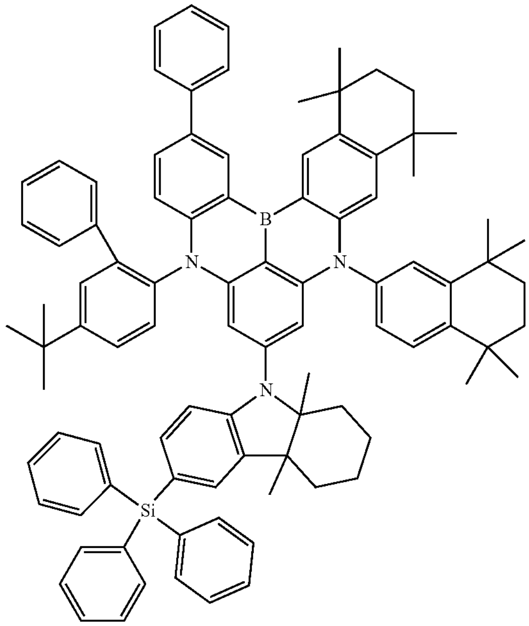
-continued
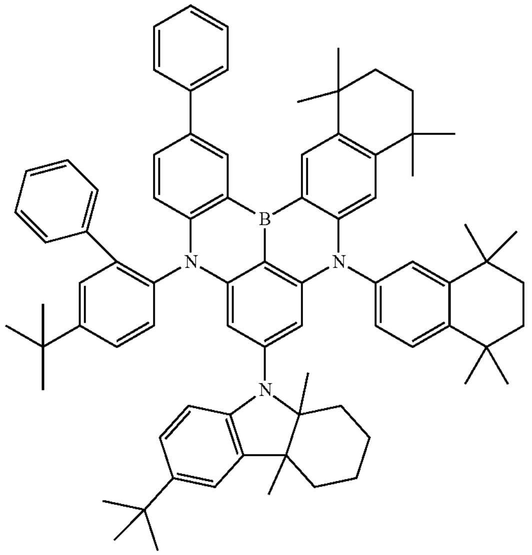
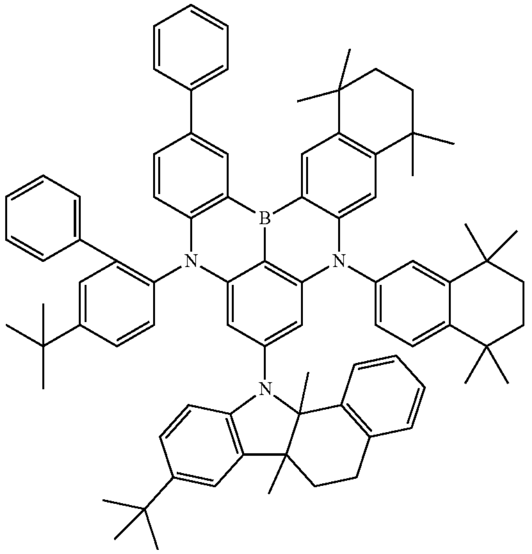
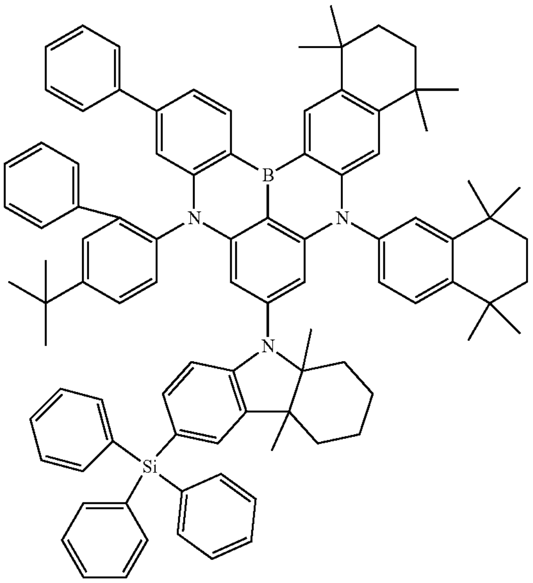

-continued
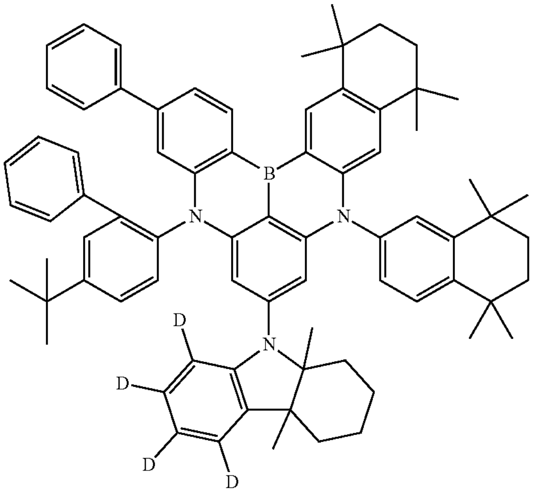
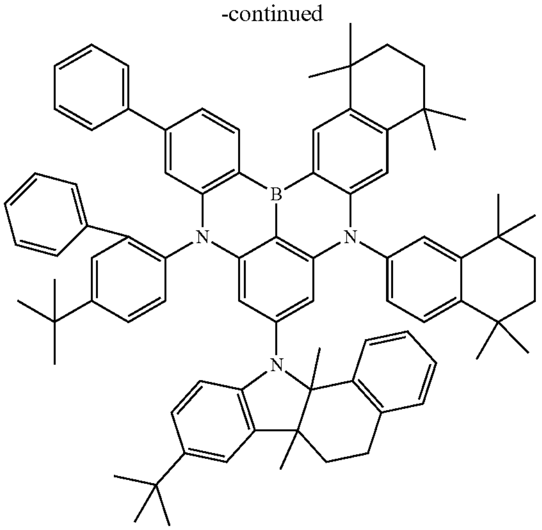
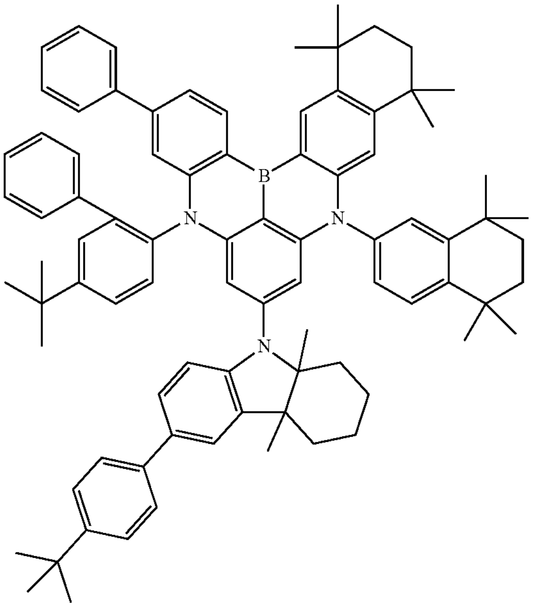
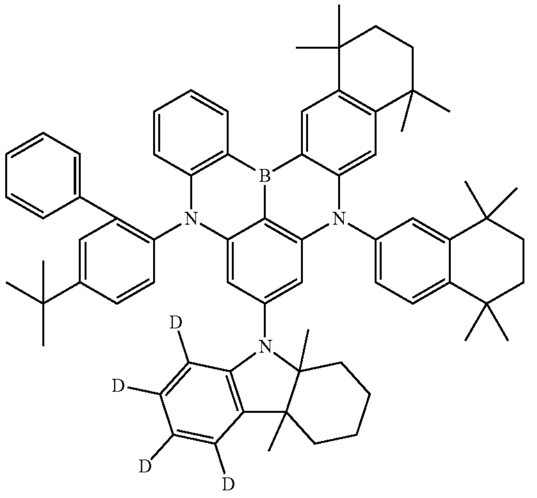
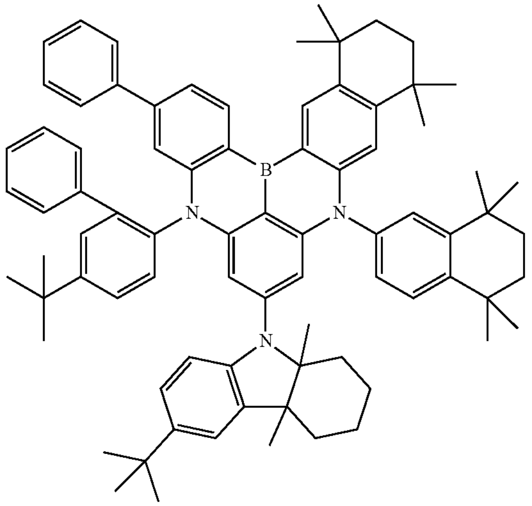
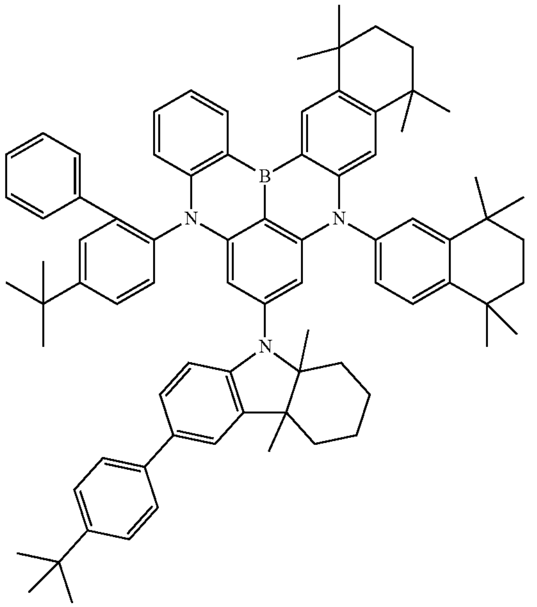
-continued -continued
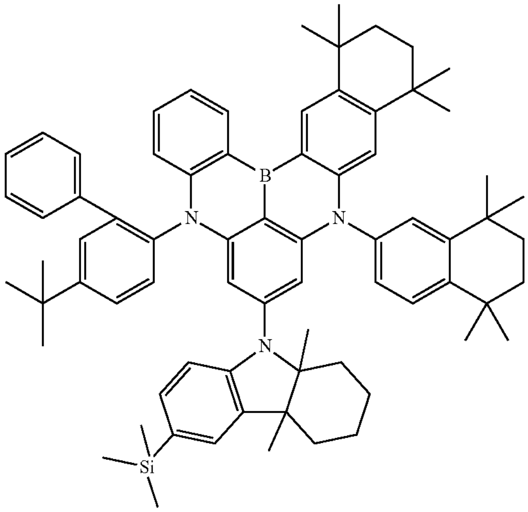
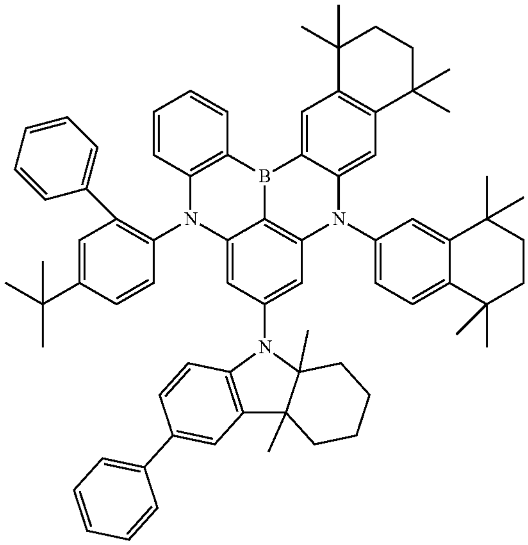
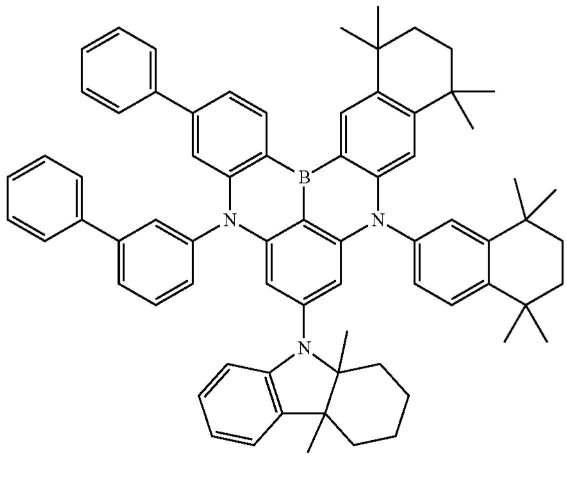
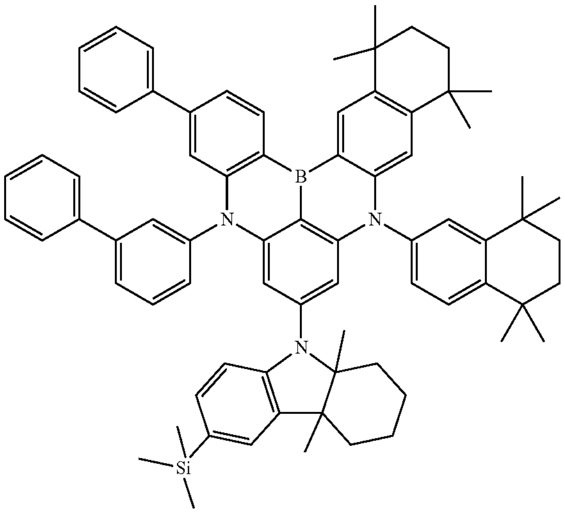
-continued
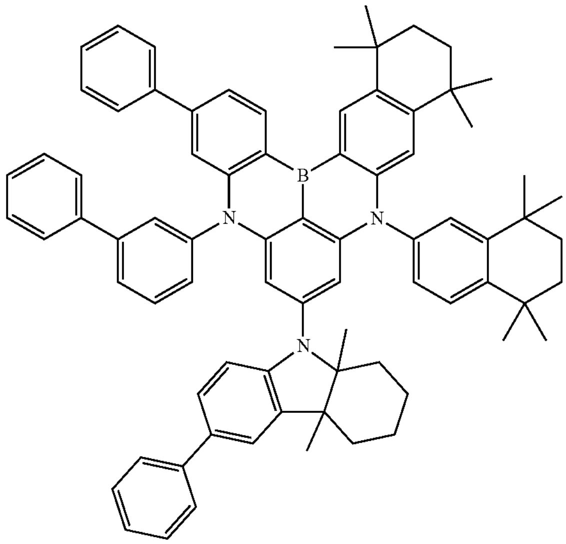
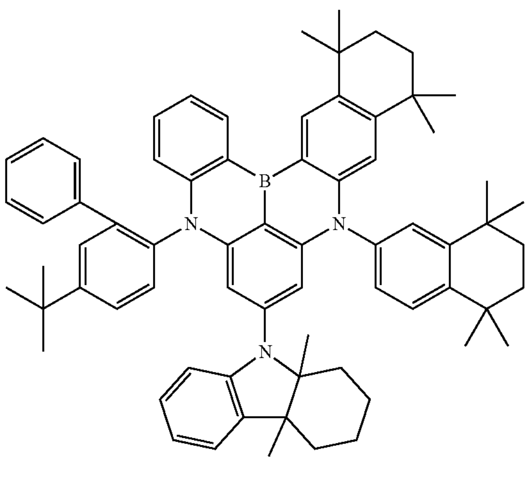

-continued
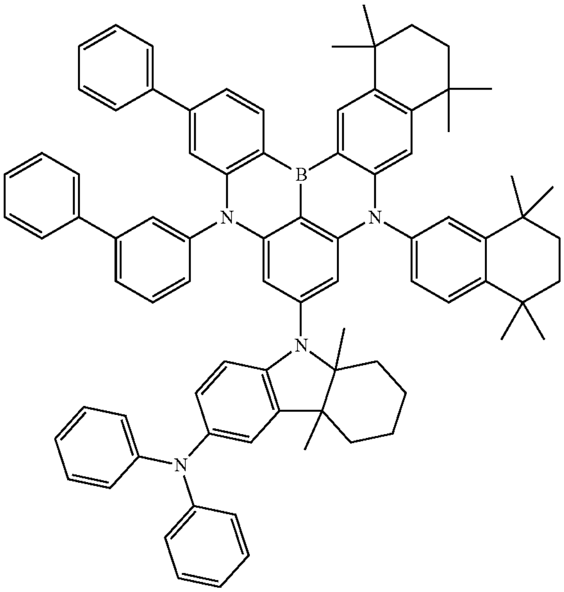
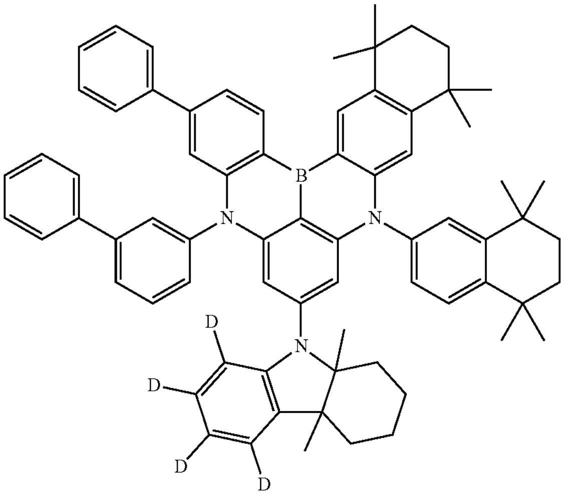
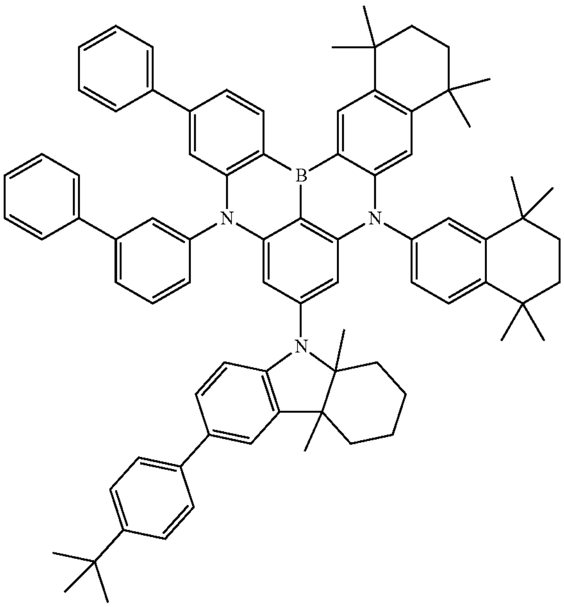
-continued
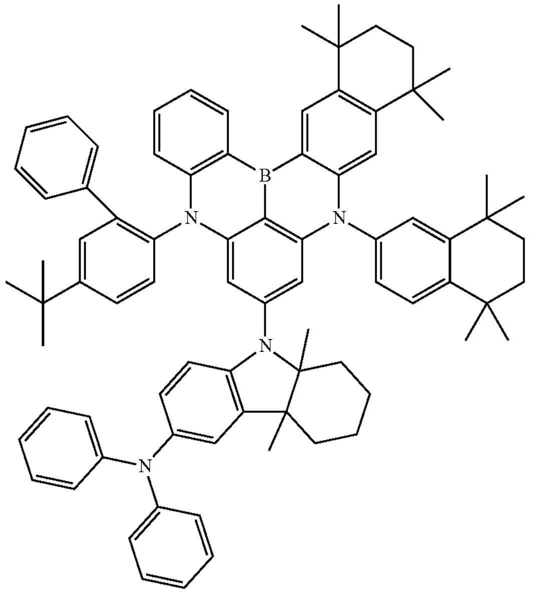
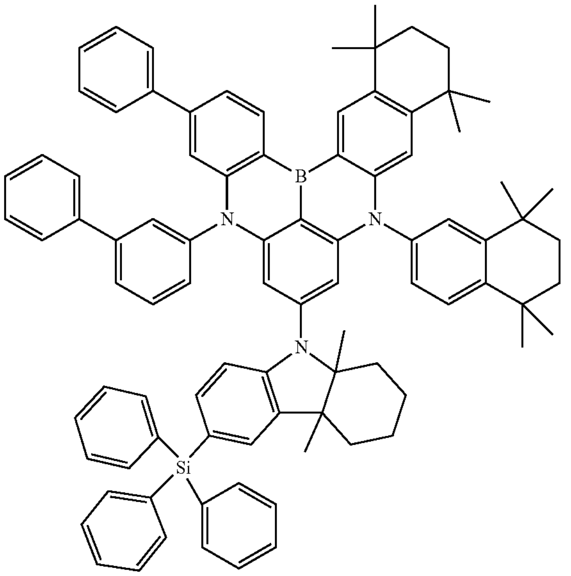
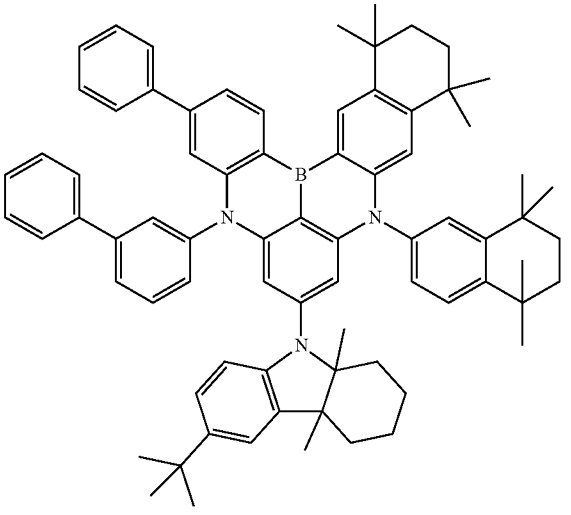

-continued
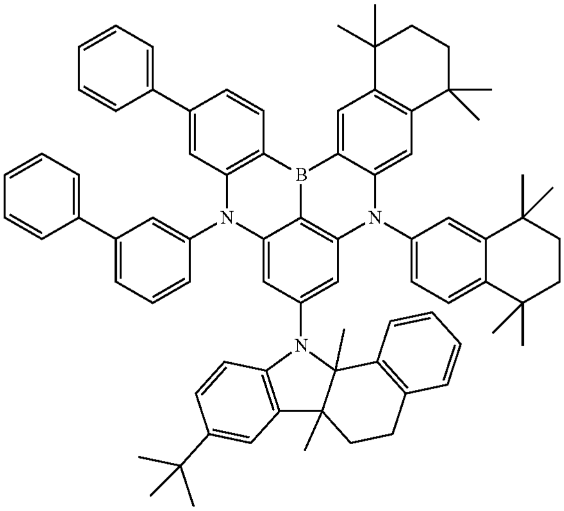
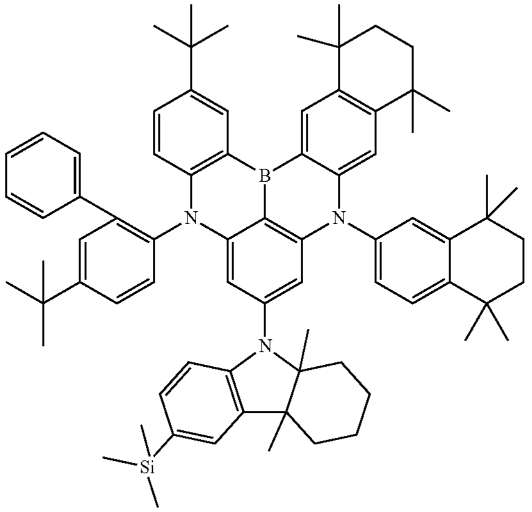
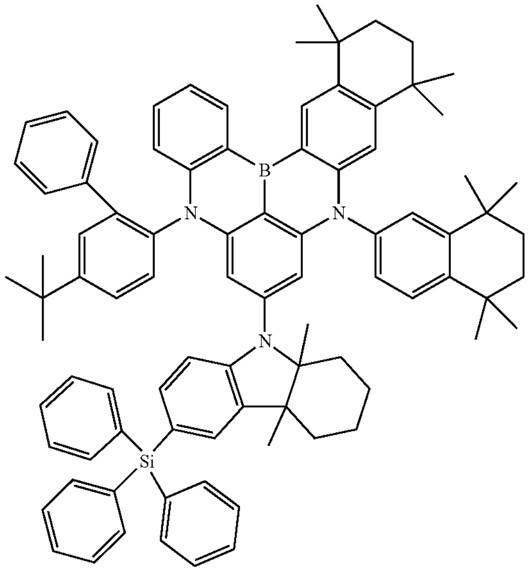
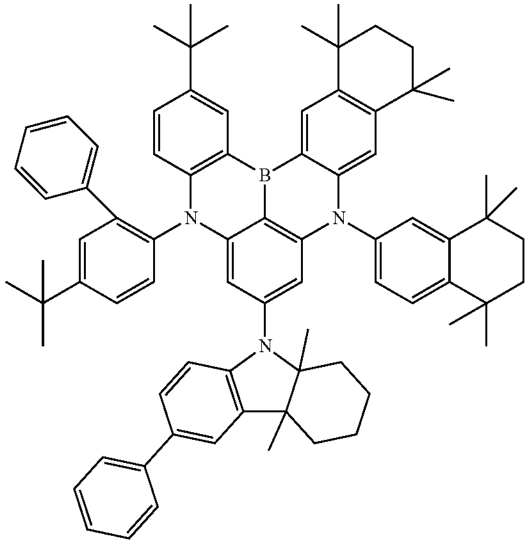
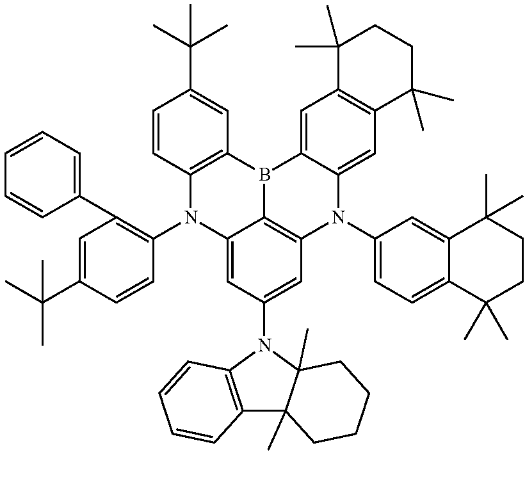
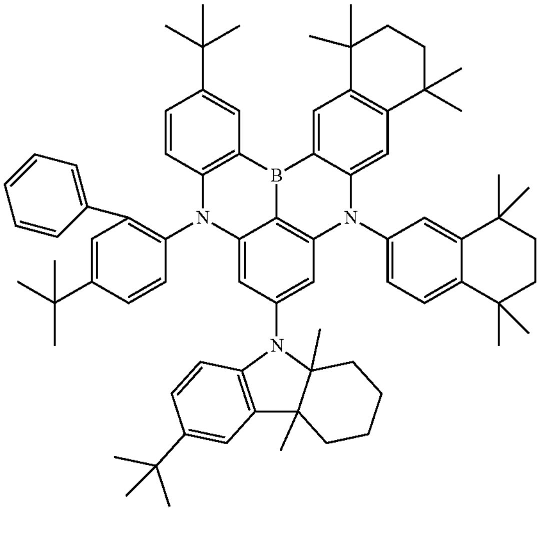
-continued -continued
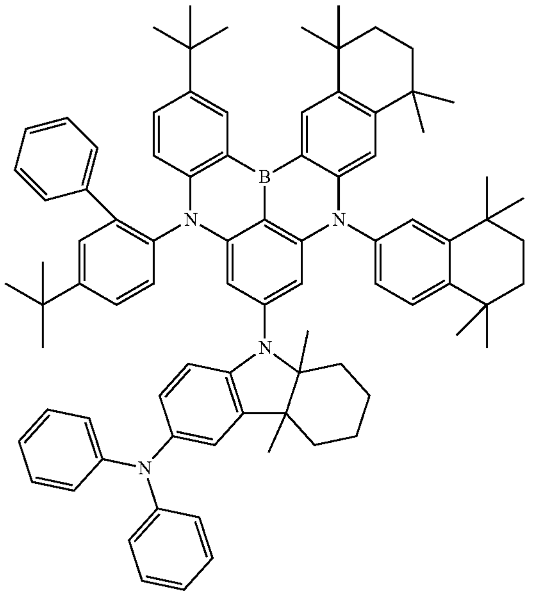
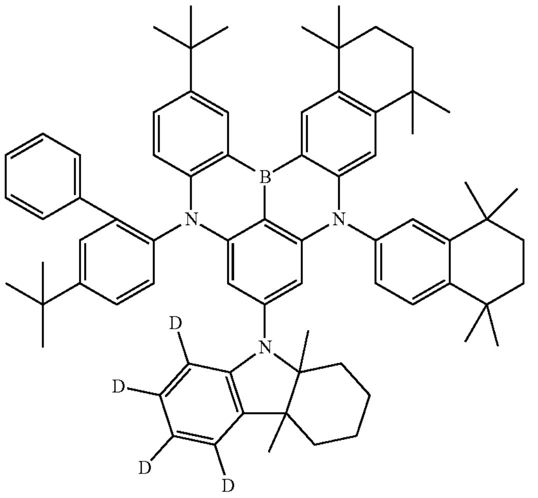
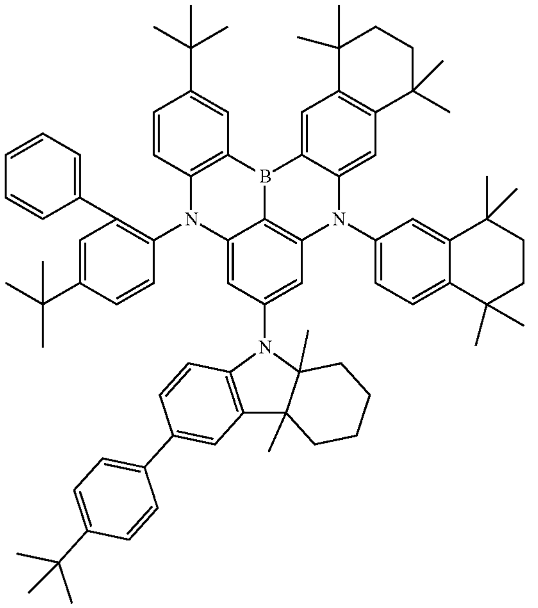
-continued
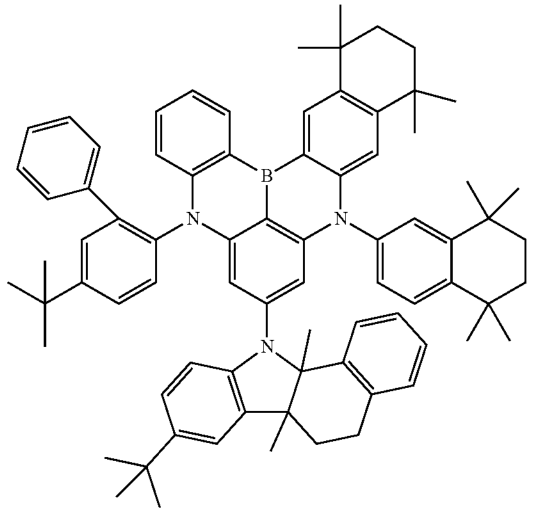
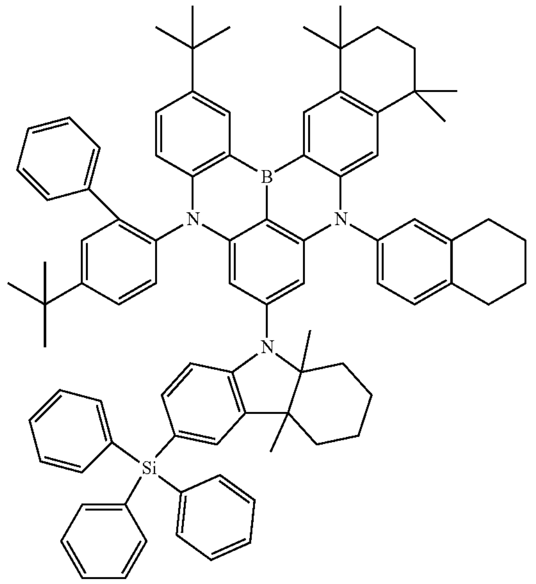
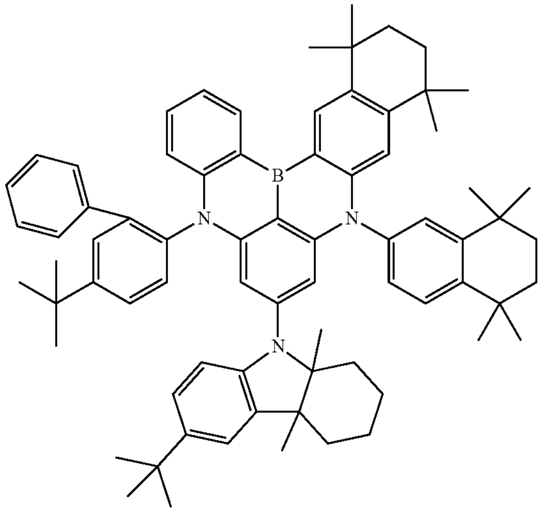

-continued
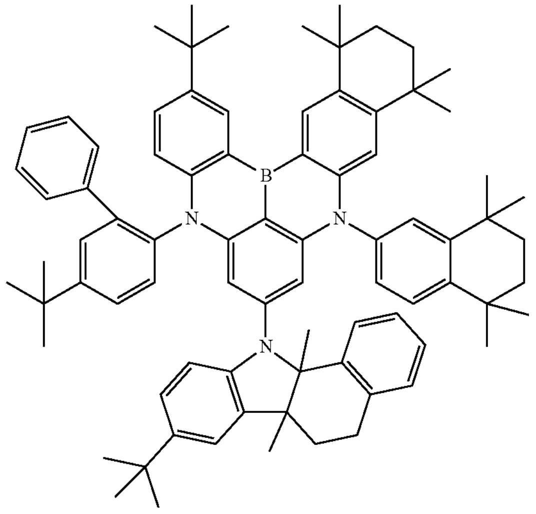
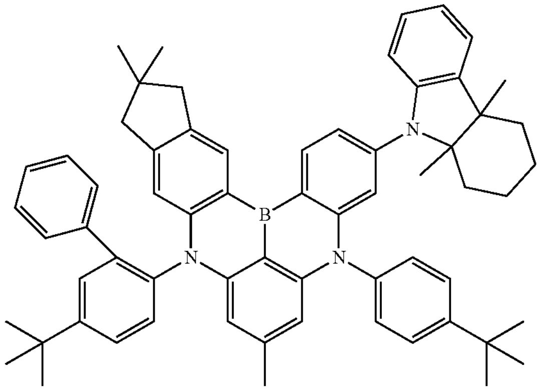
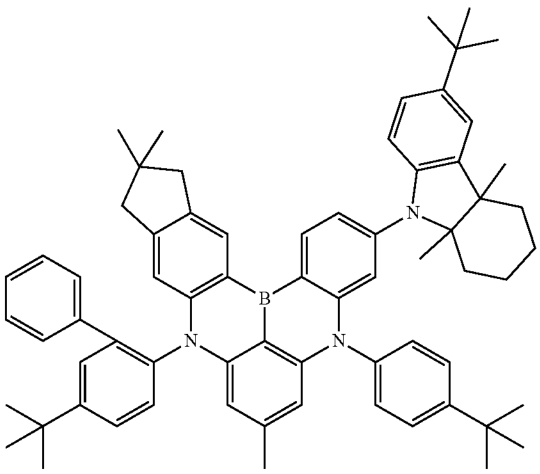
-continued
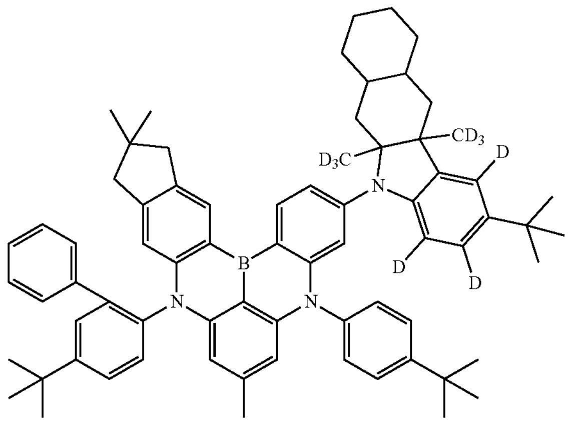
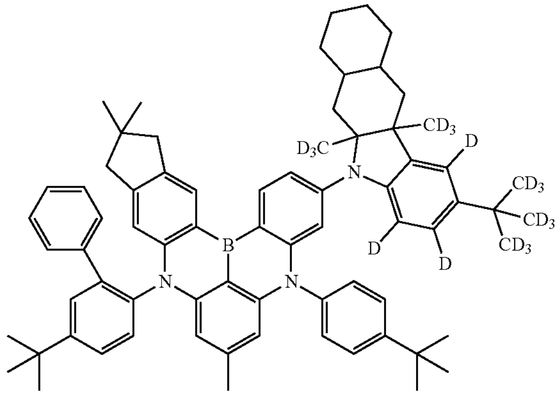
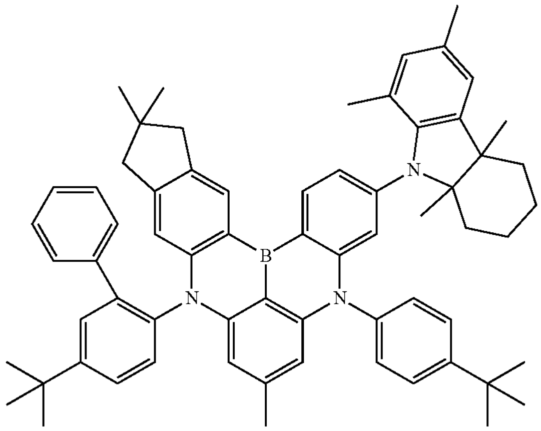

-continued
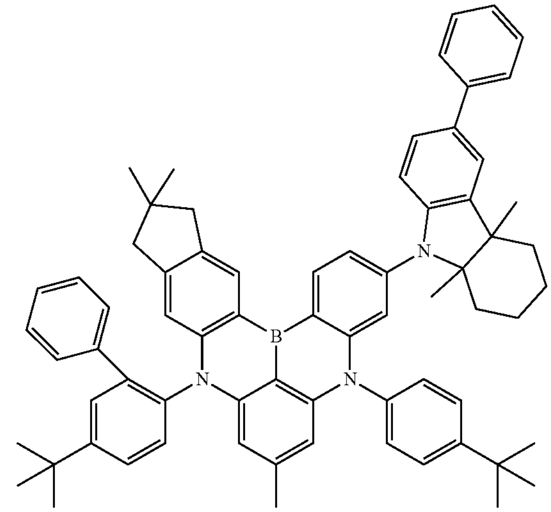
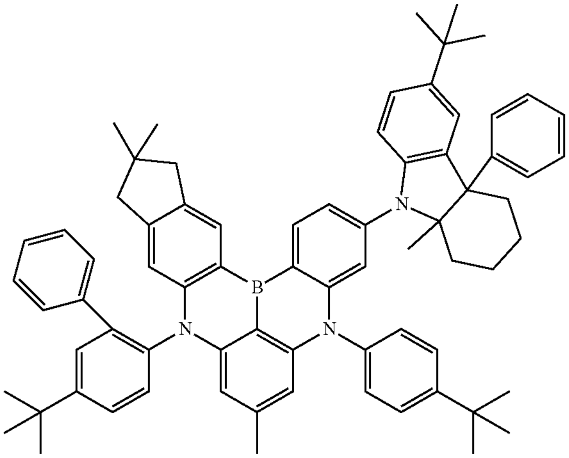
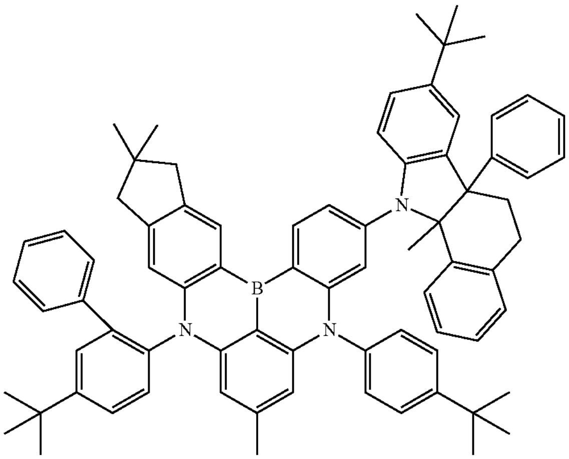
-continued
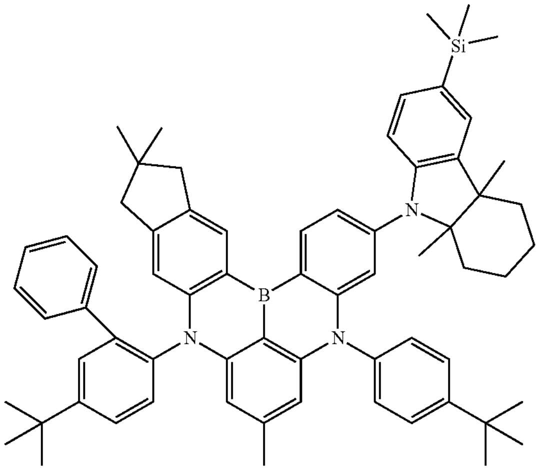
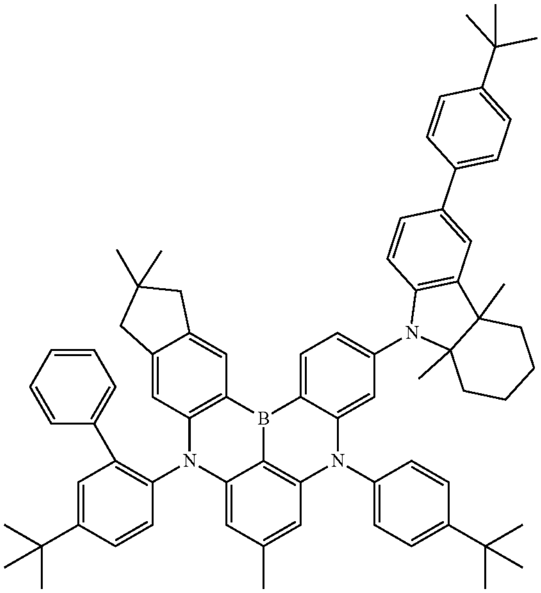
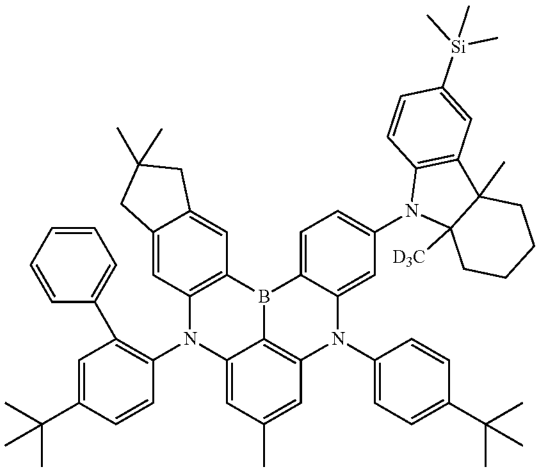

-continued
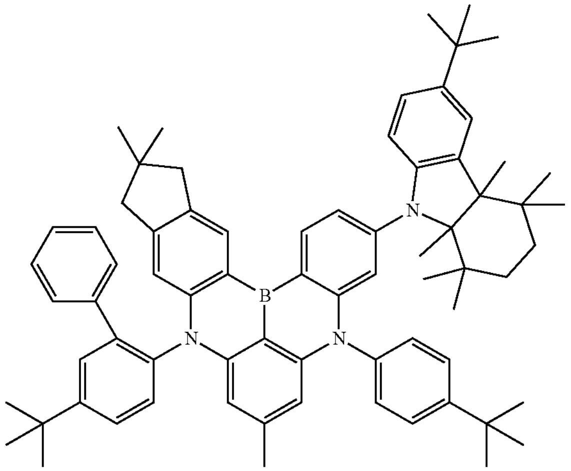
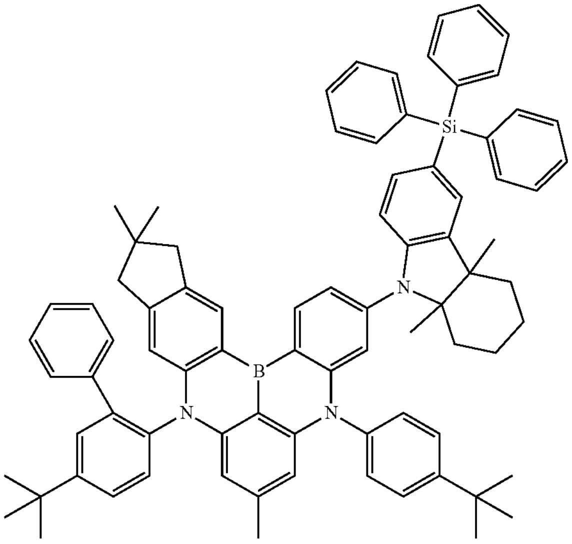
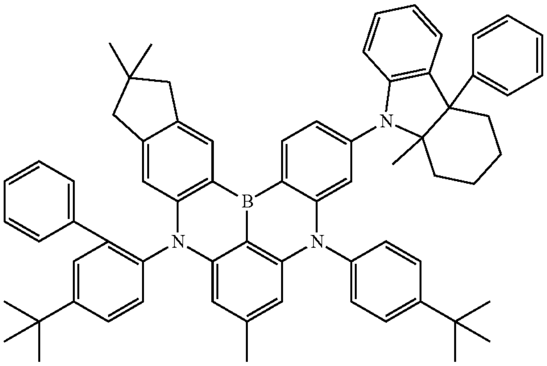
-continued
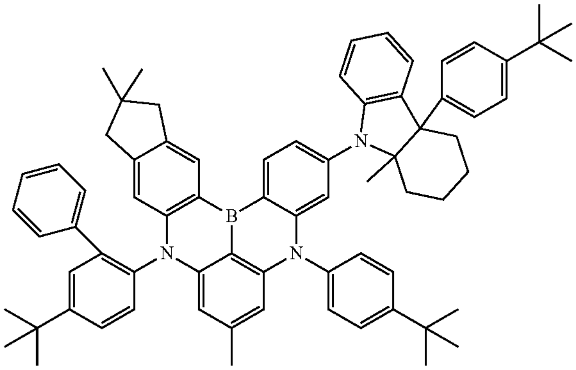
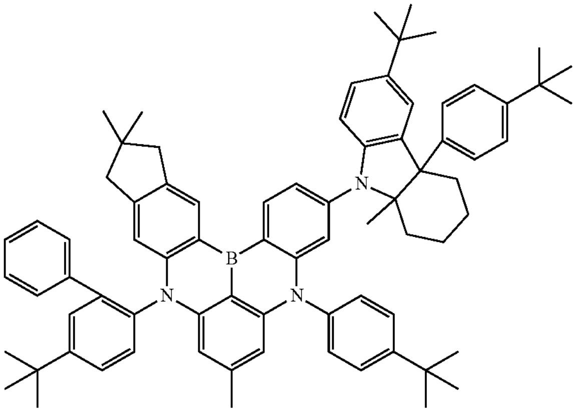
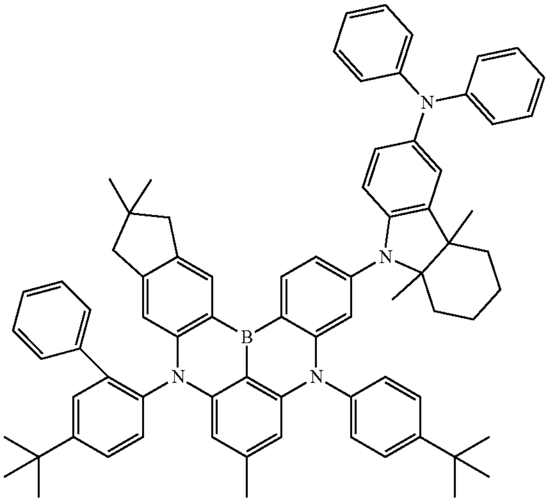
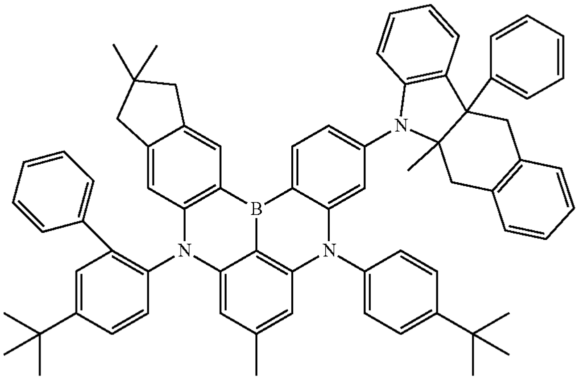

-continued
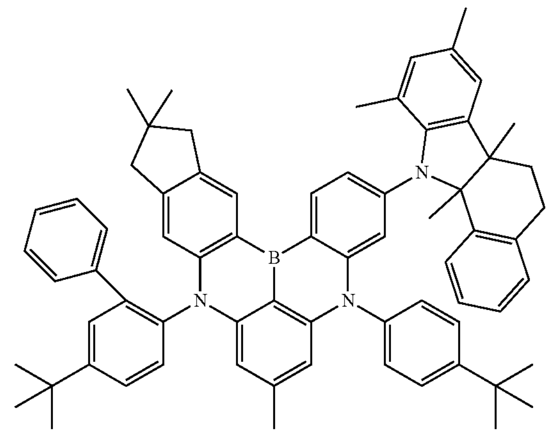
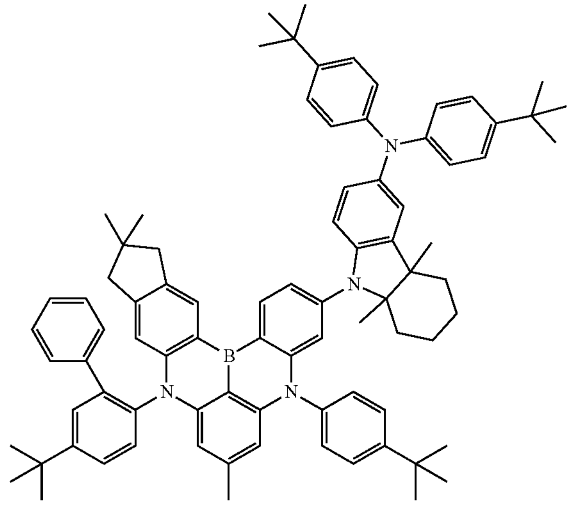
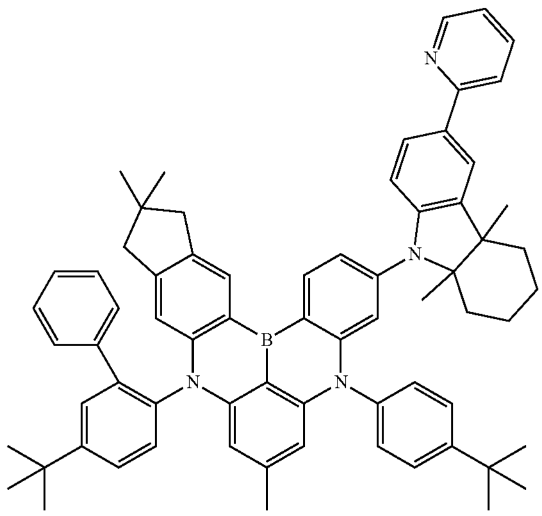
-continued
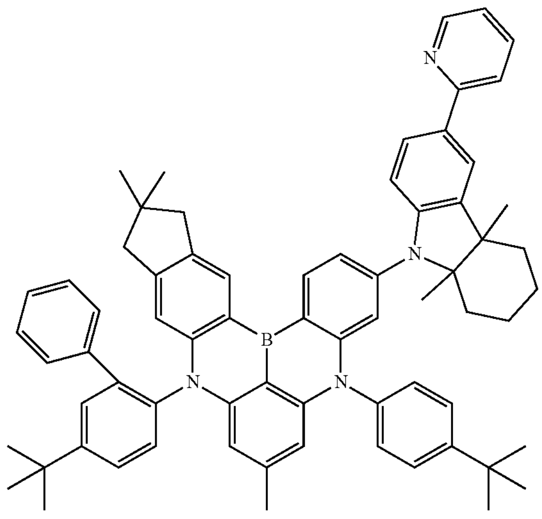
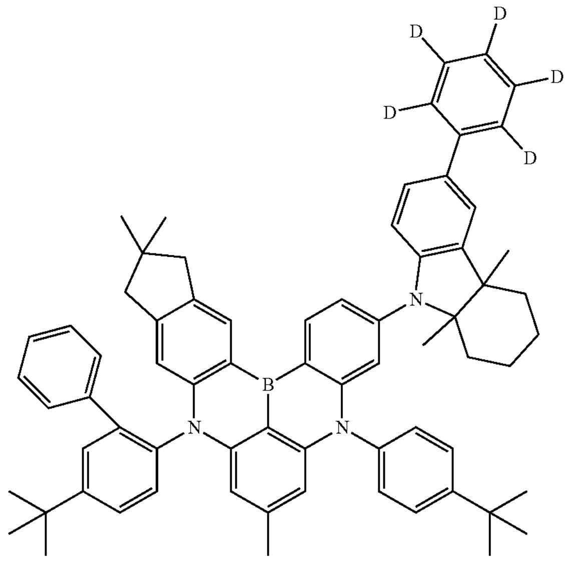
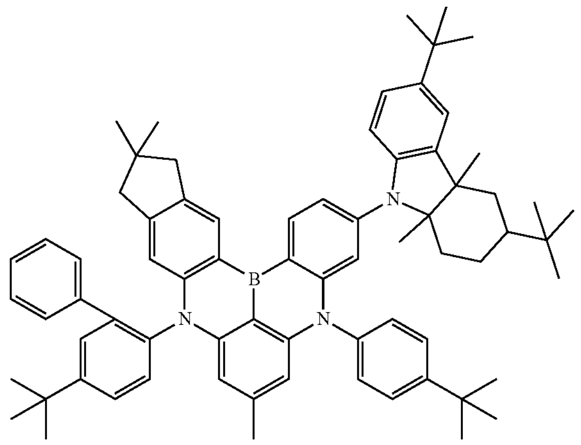

-continued
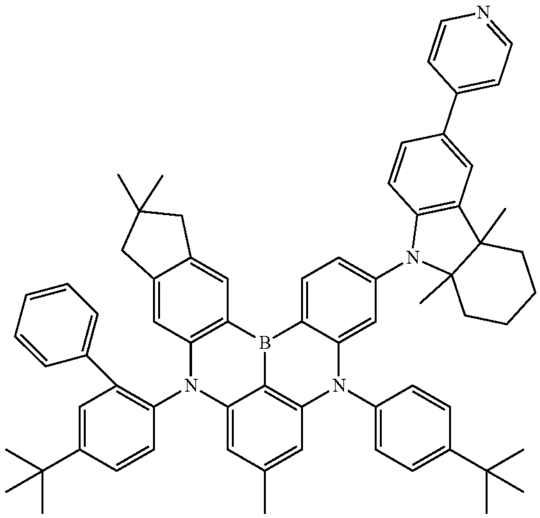
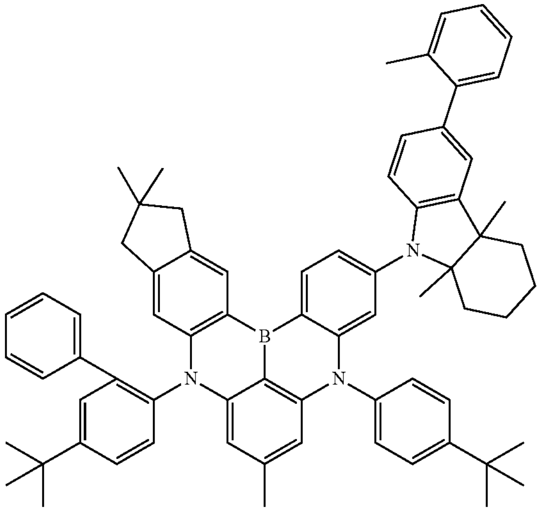
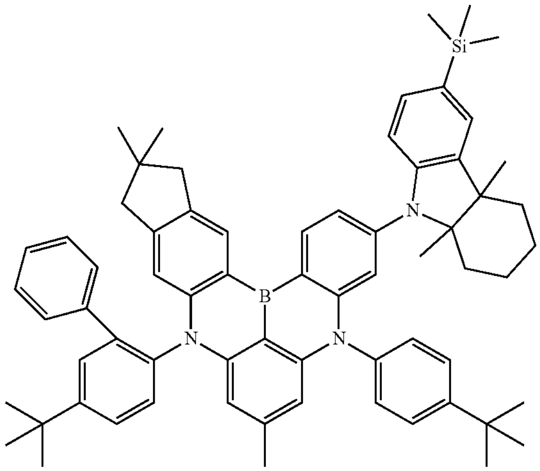
-continued
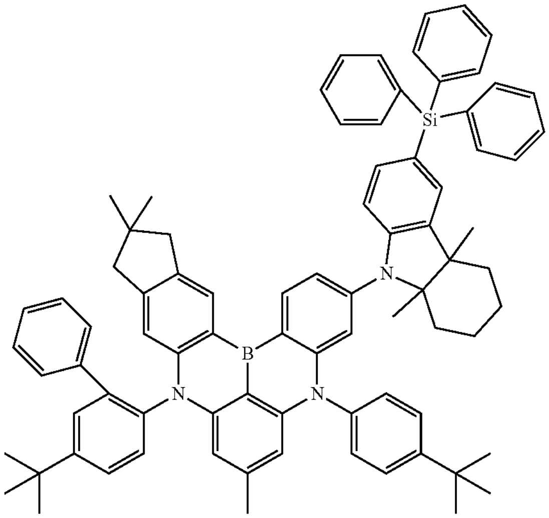
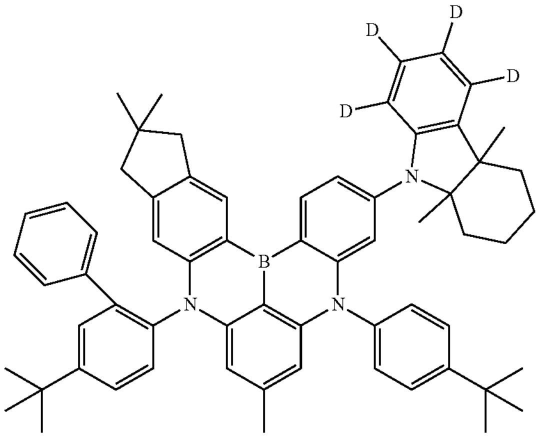
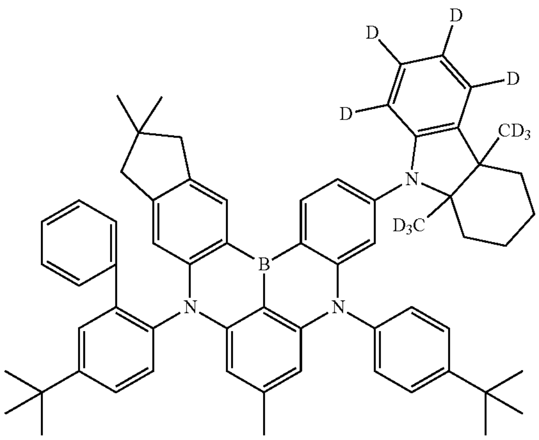

-continued
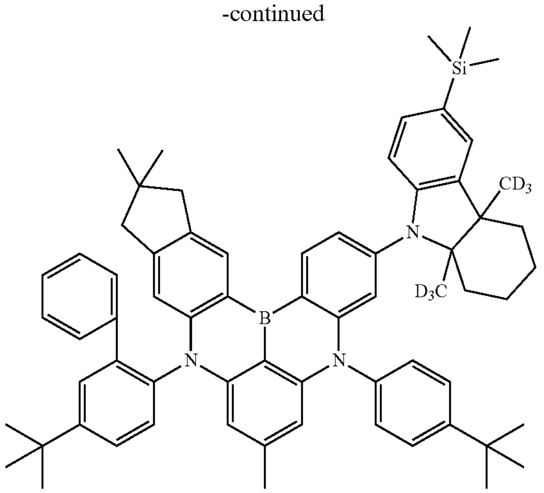
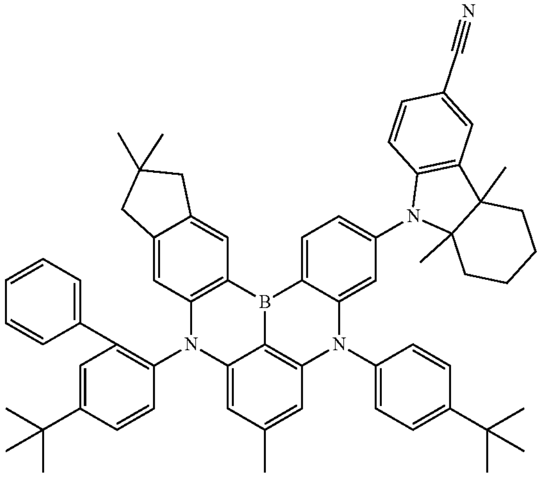
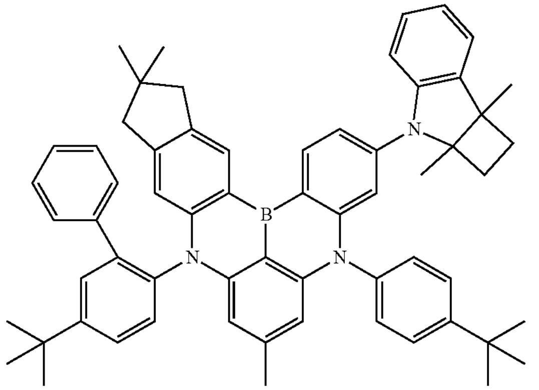
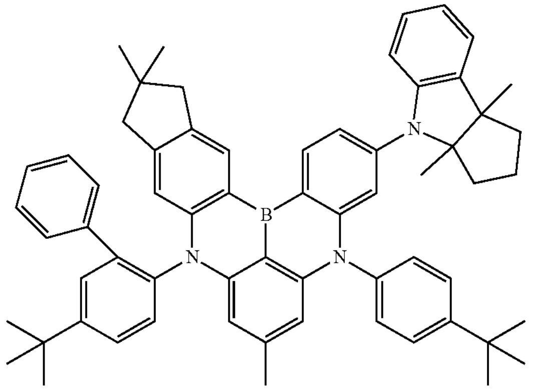
-continued
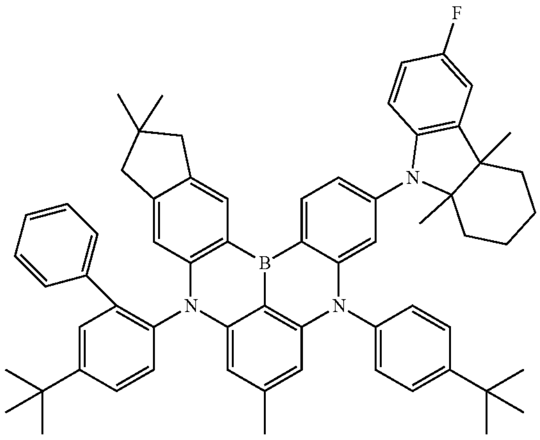
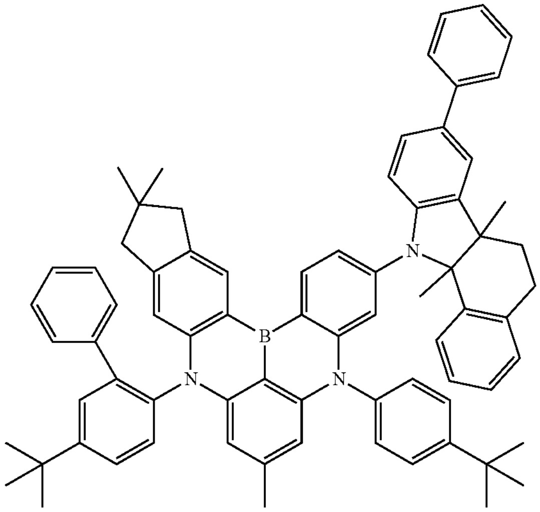
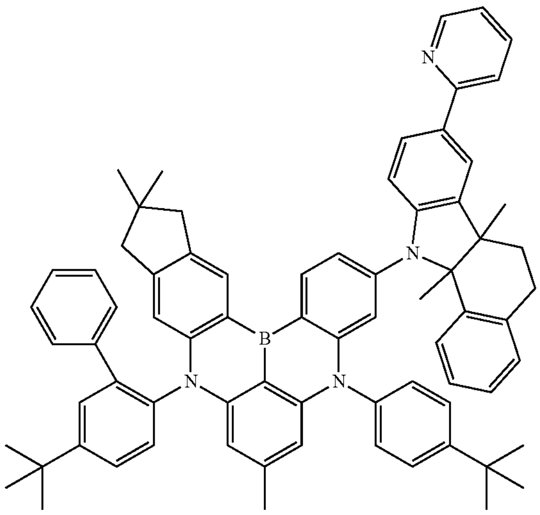

-continued
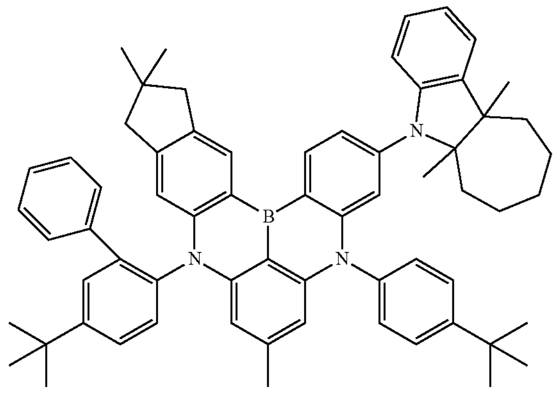
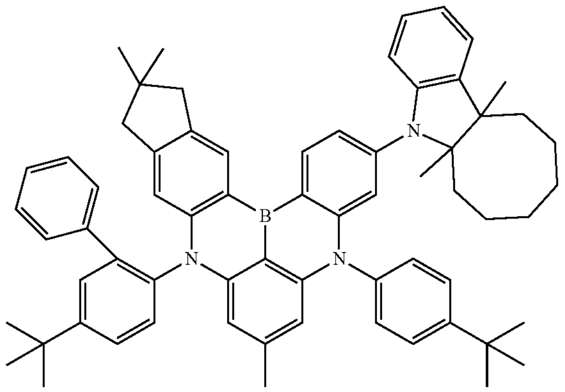
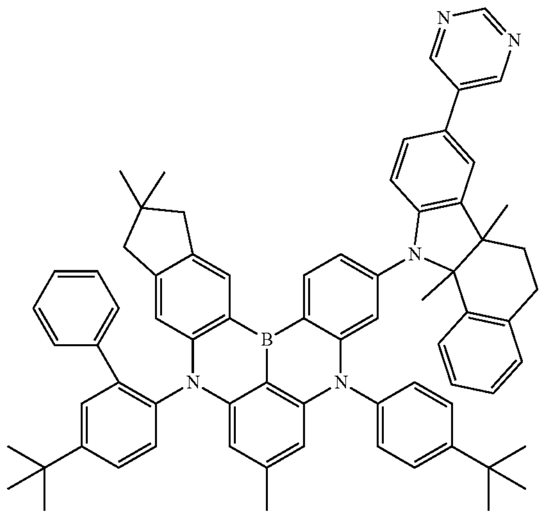
-continued
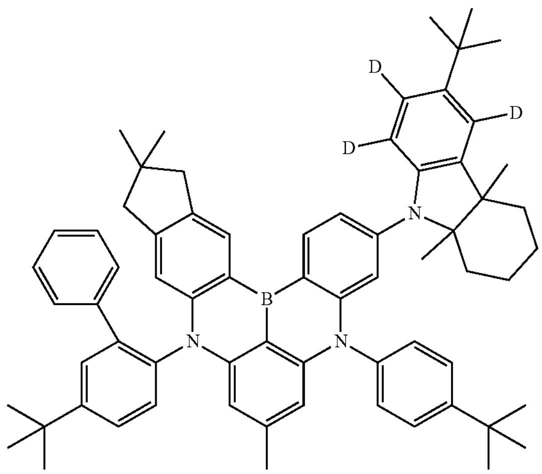
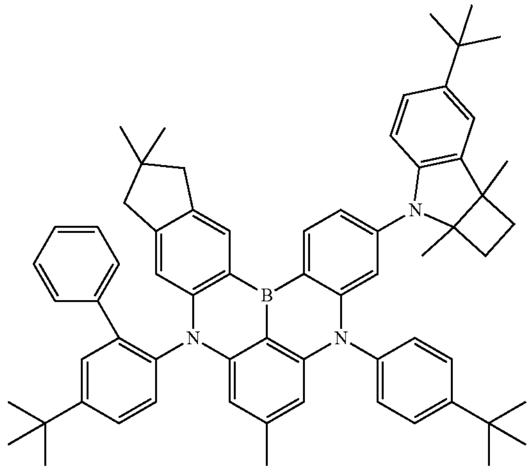
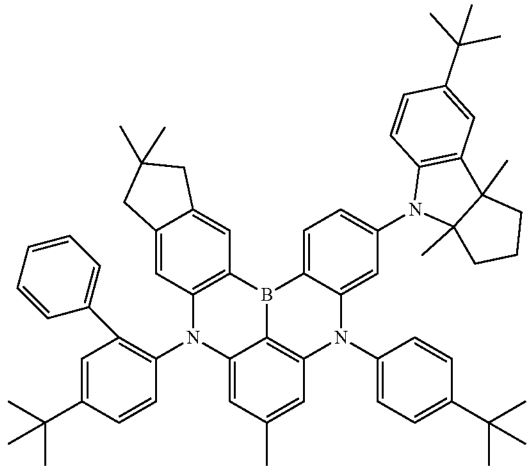

-continued
-continued
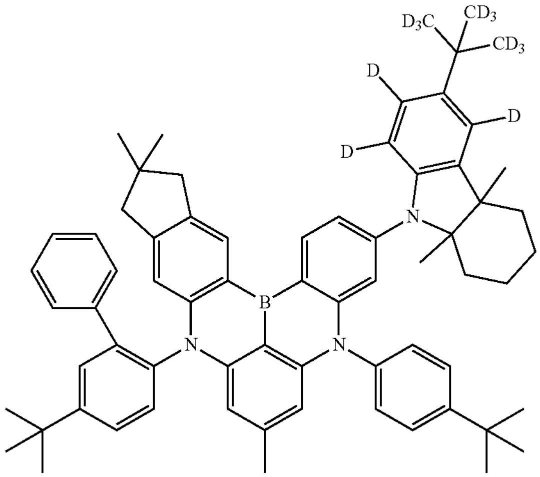
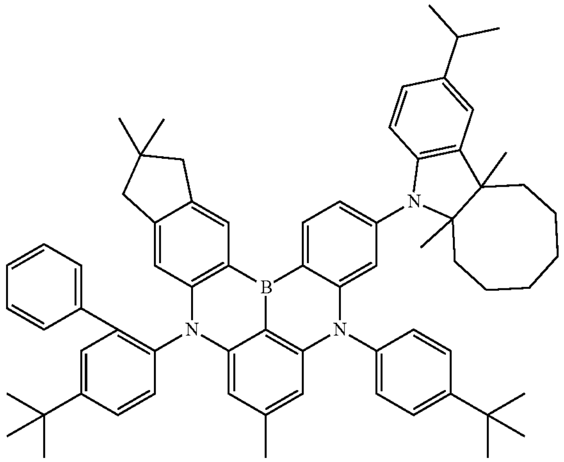
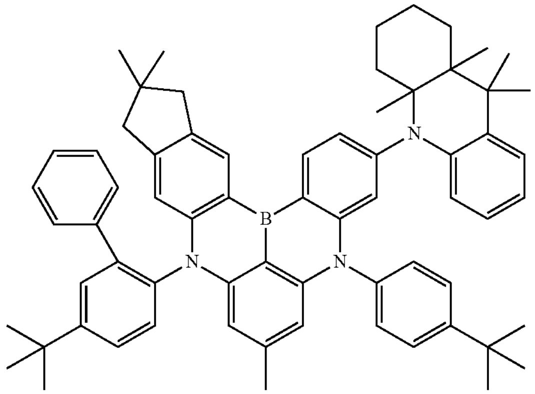
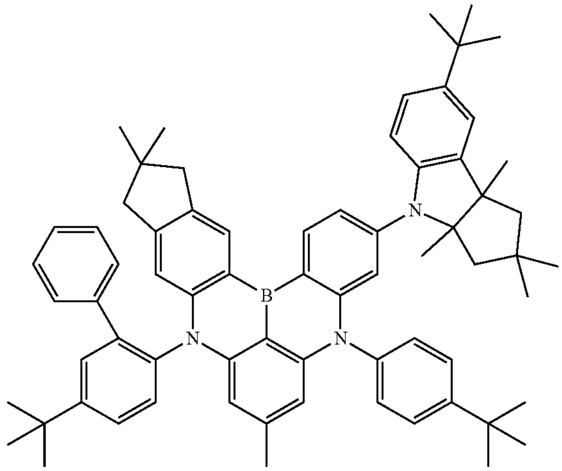
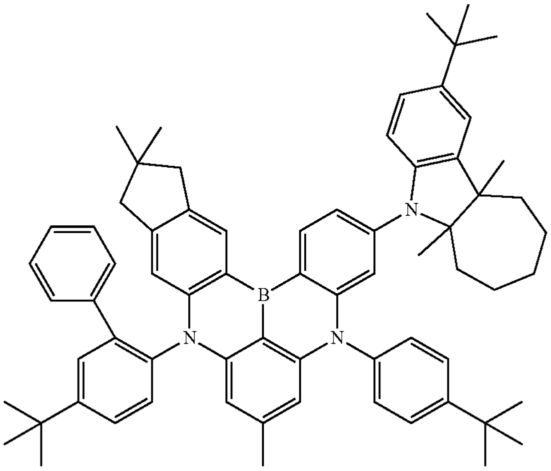
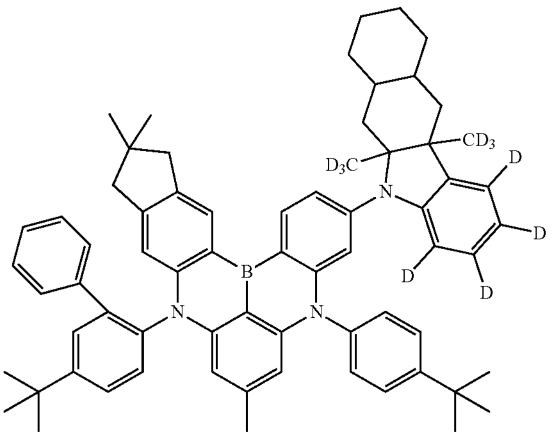

-continued
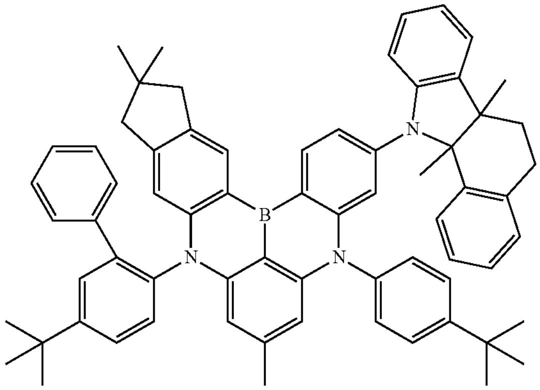
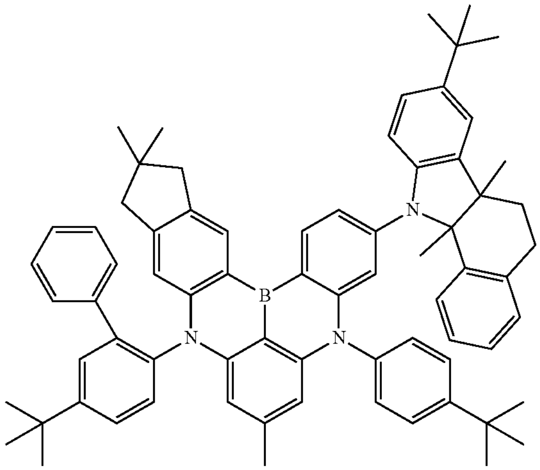
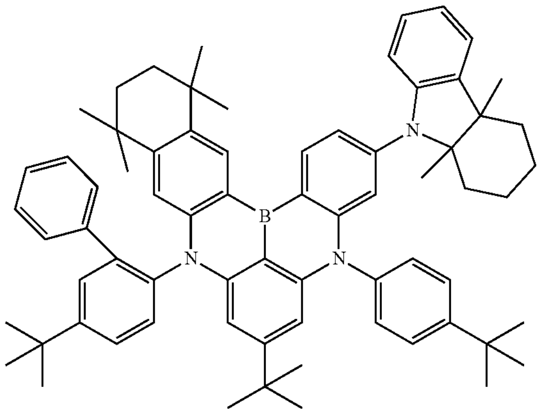
-continued
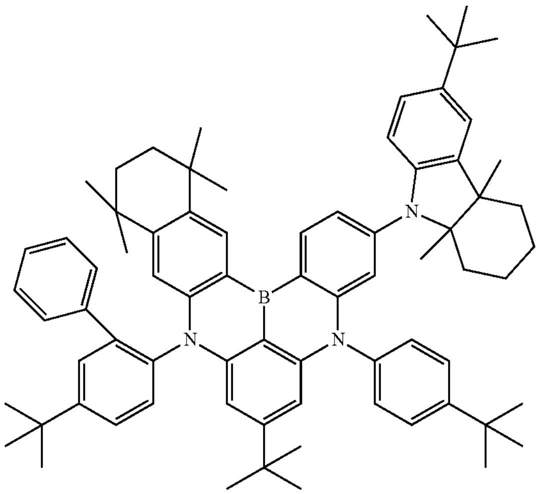
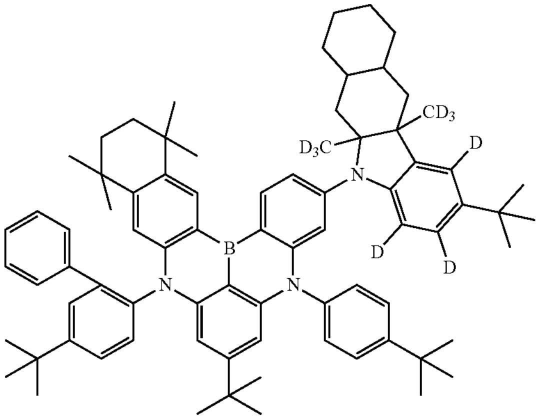
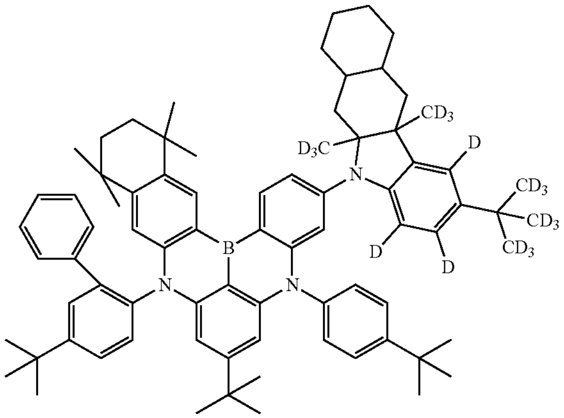

-continued
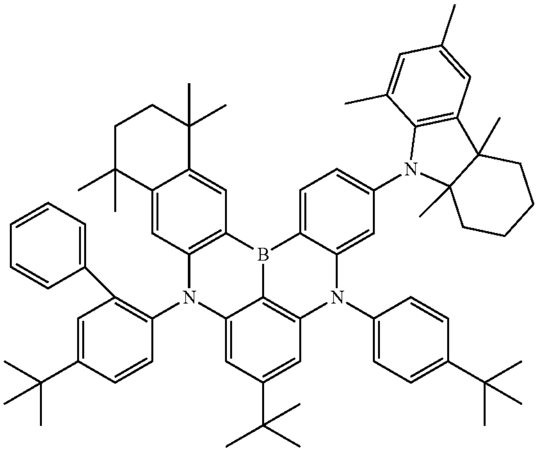
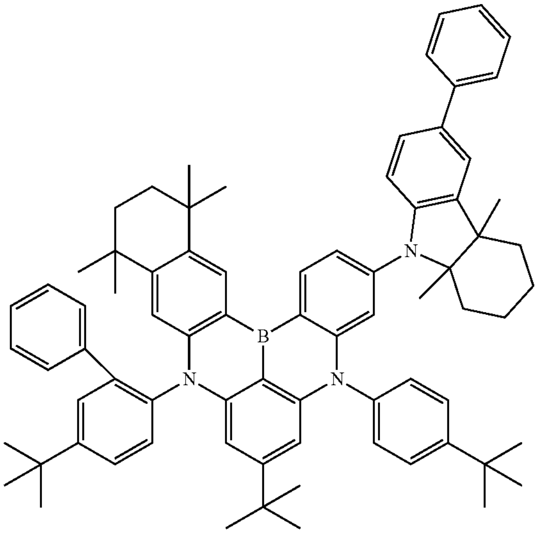
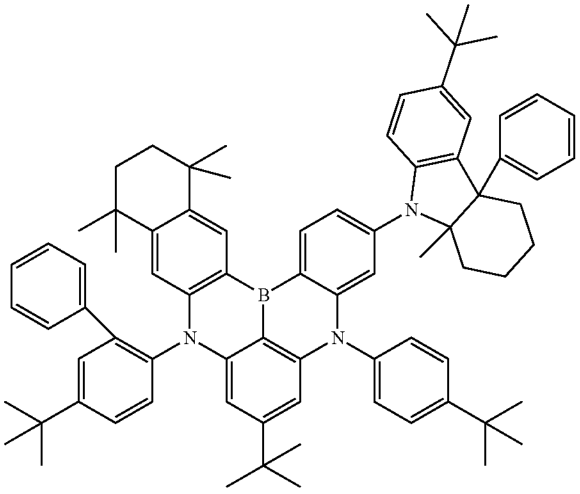
-continued
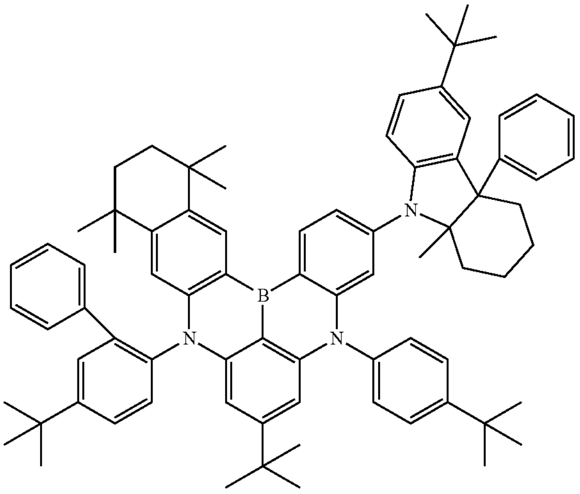
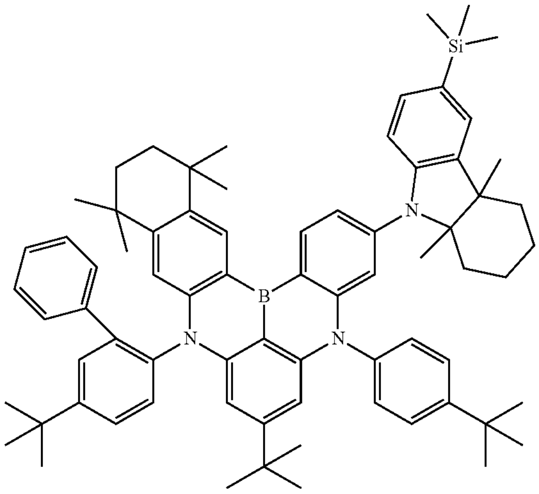
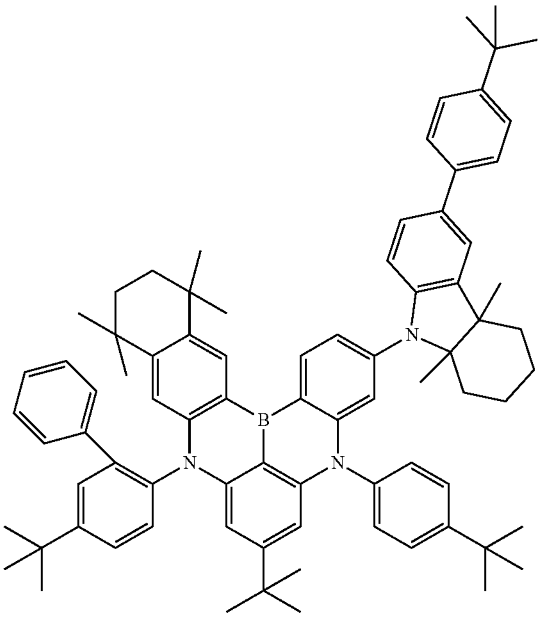

-continued
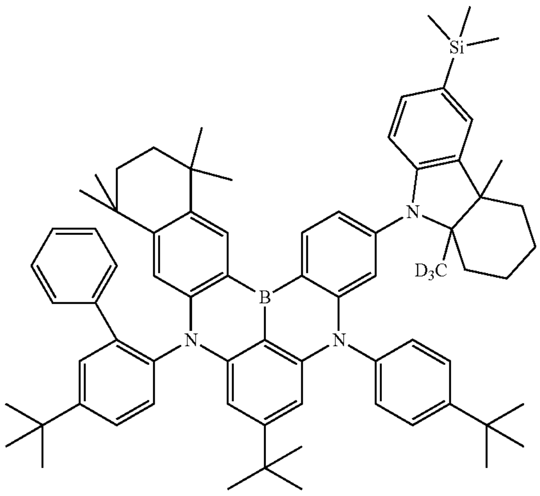
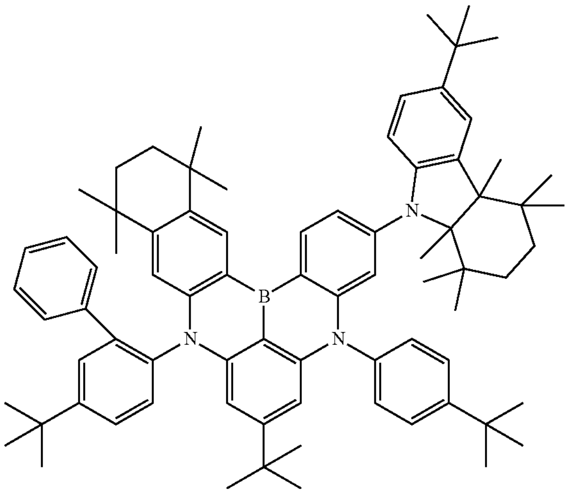
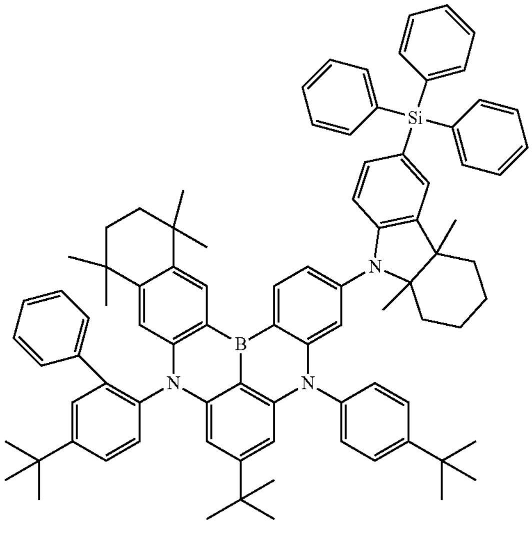
-continued
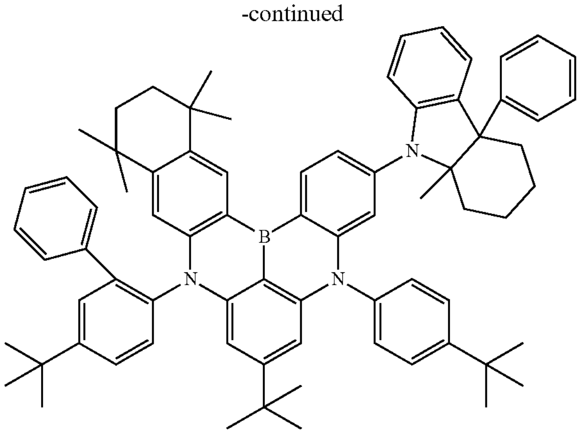
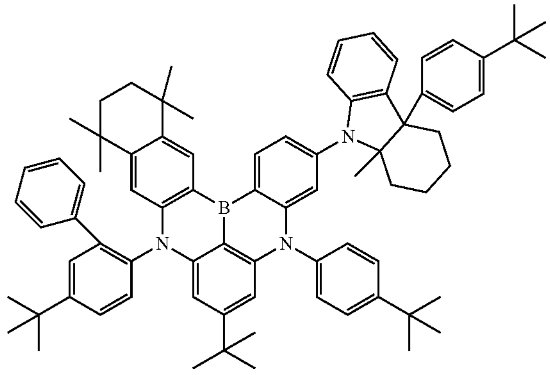
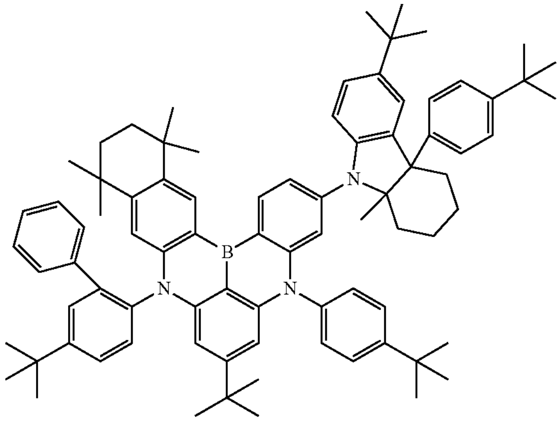
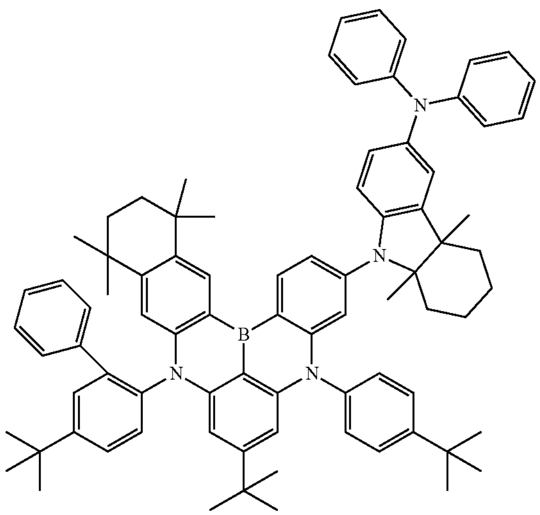

-continued
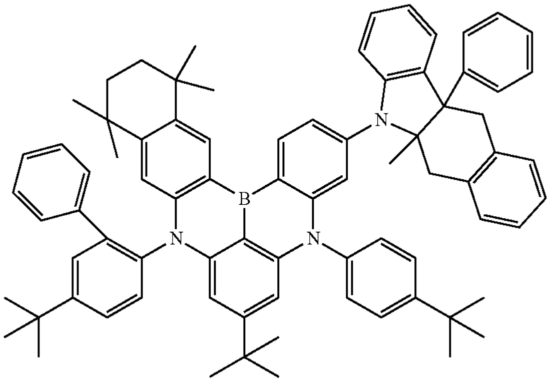
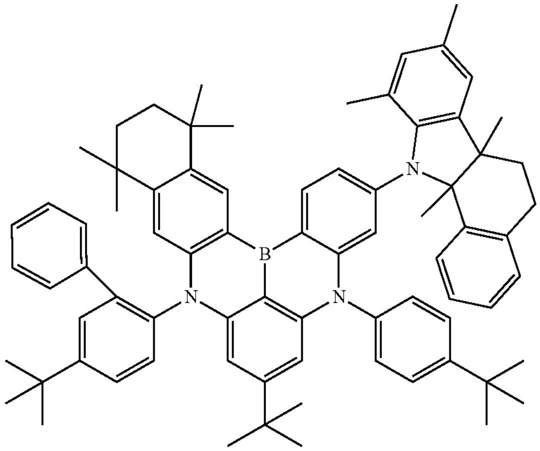
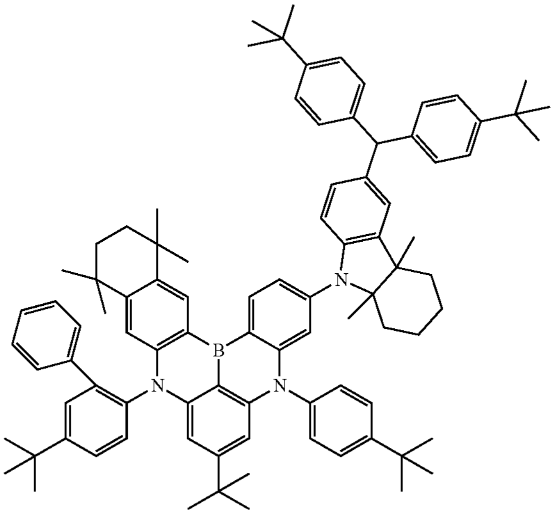
-continued
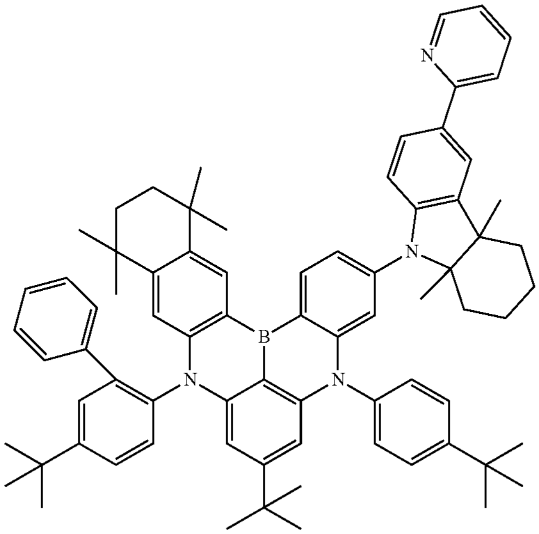
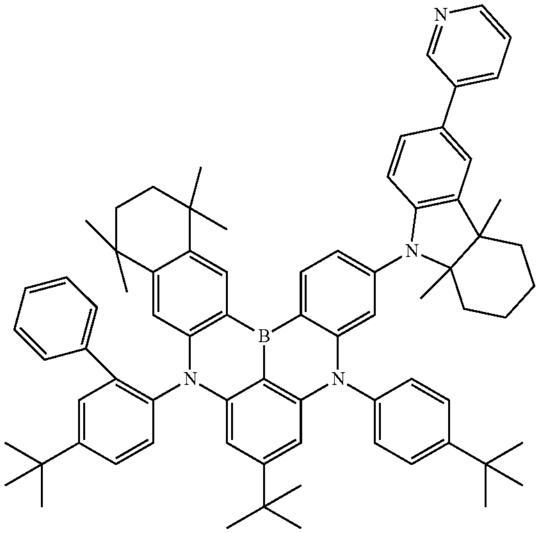
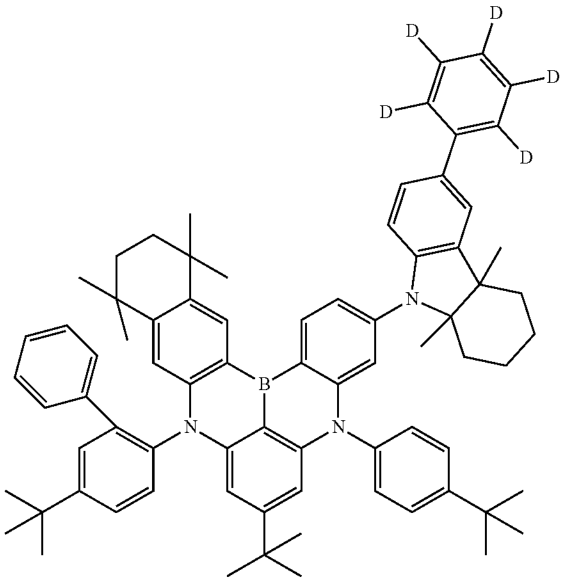

-continued
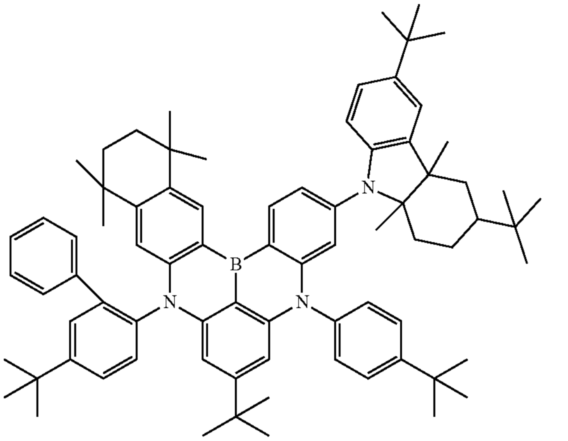
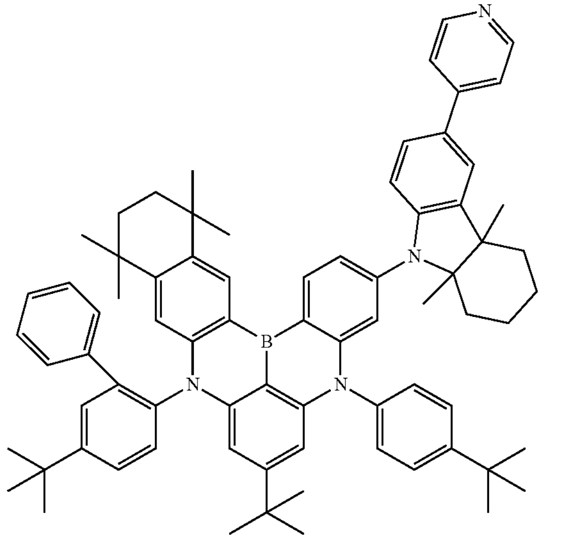
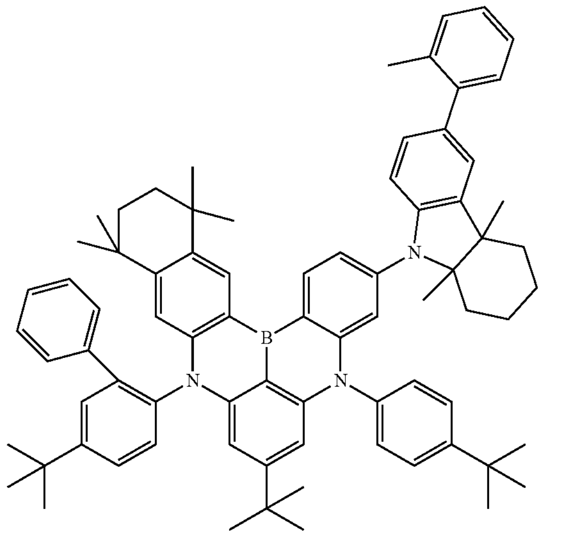
-continued
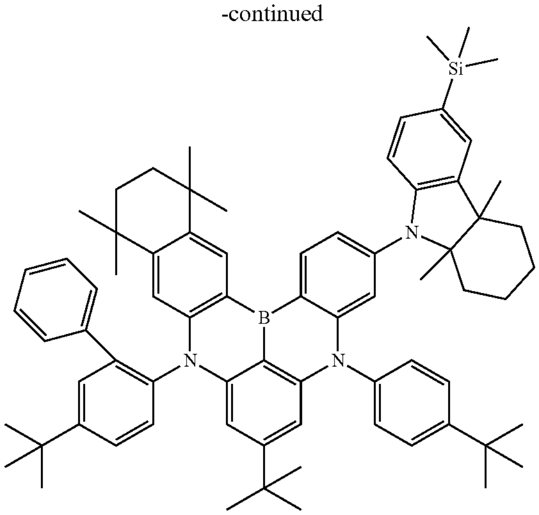
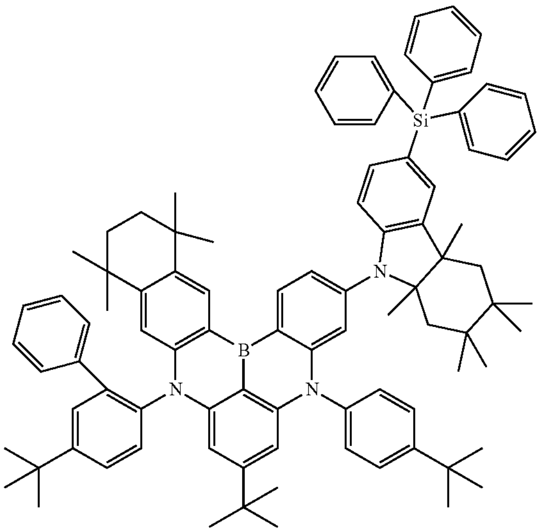
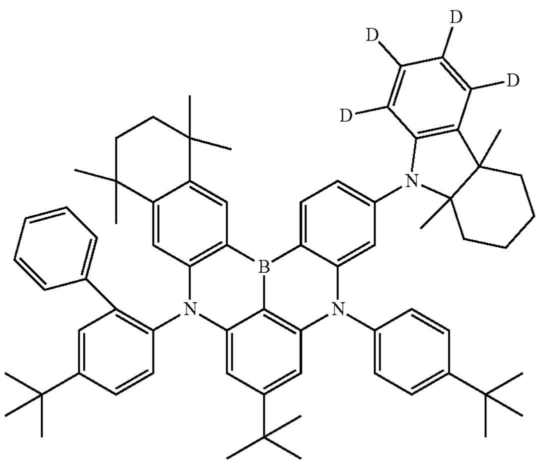

-continued
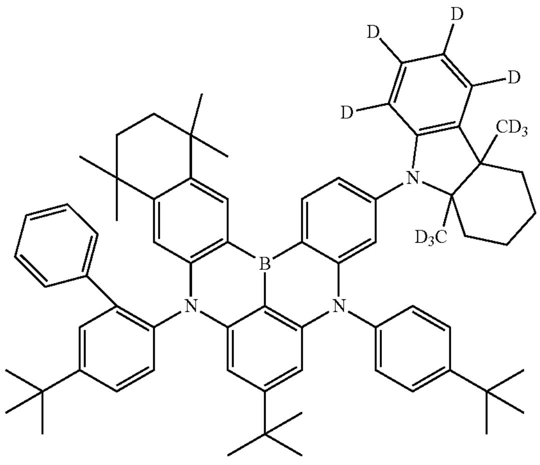
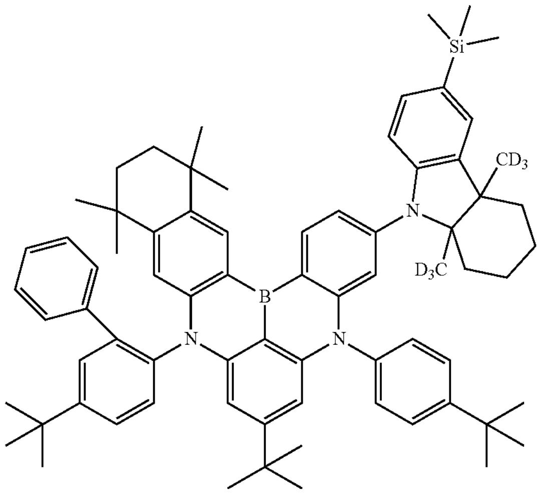
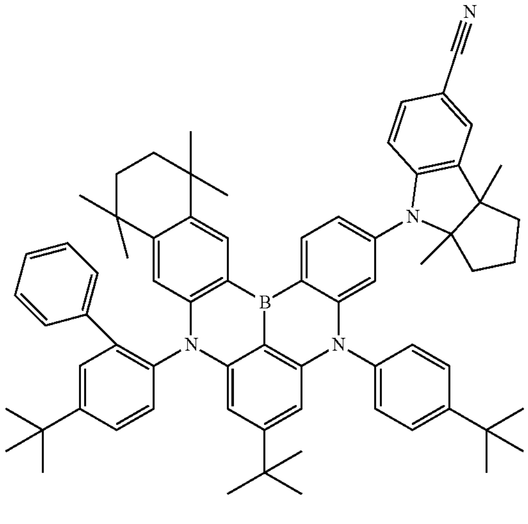
-continued
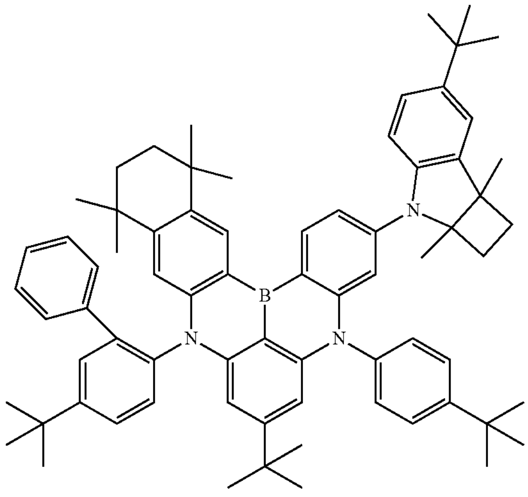
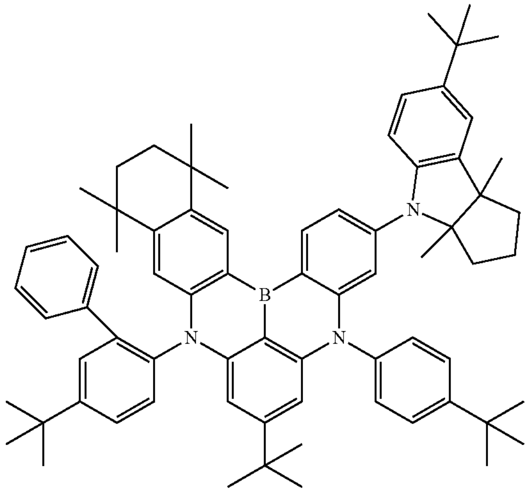
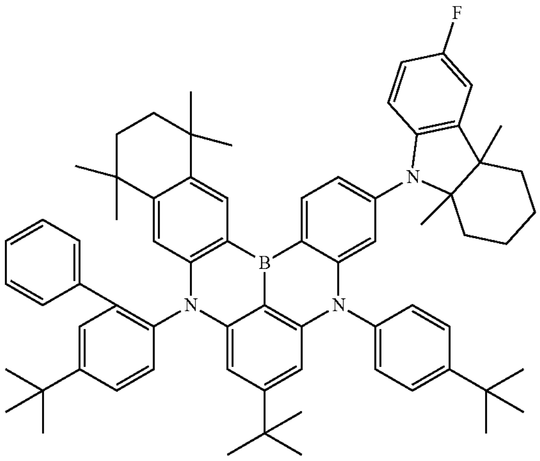

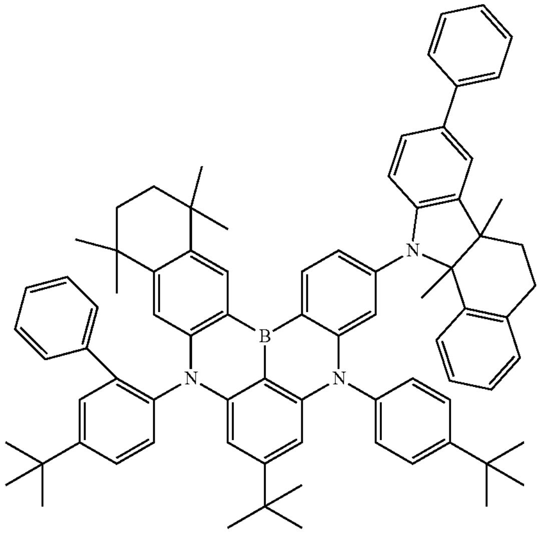
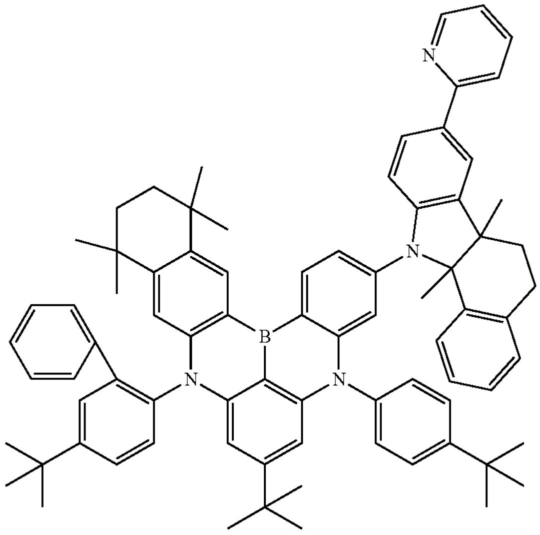
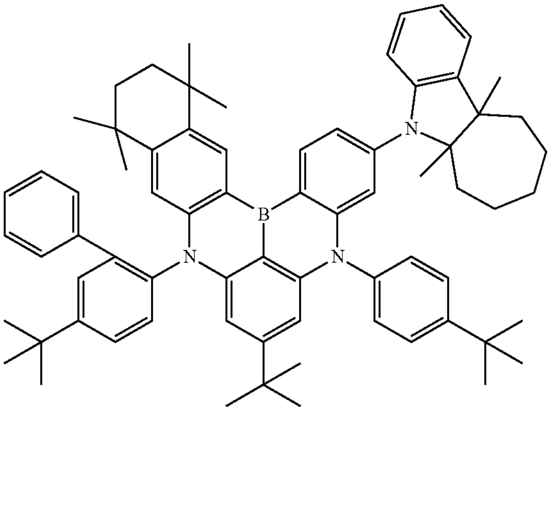
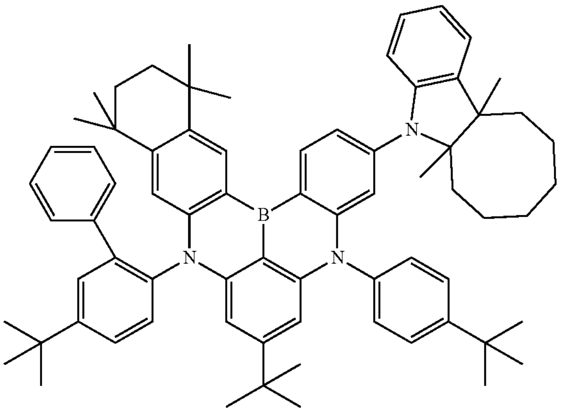
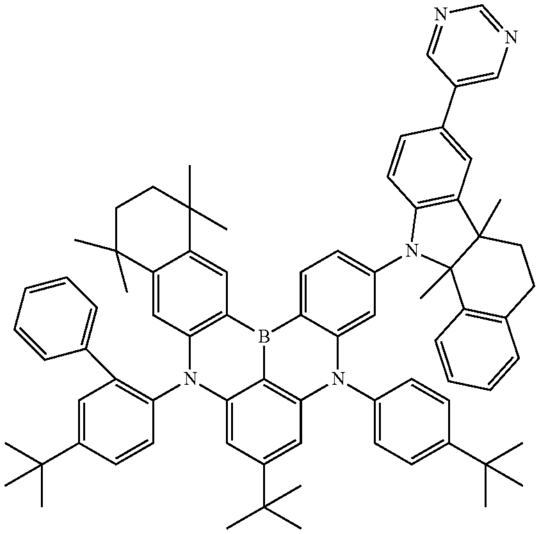
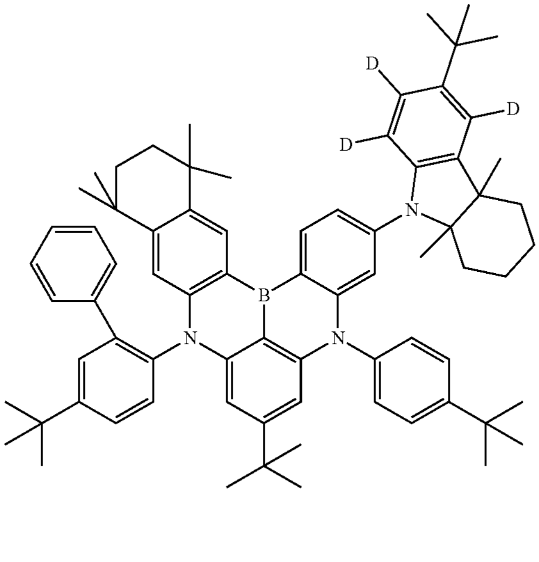

-continued
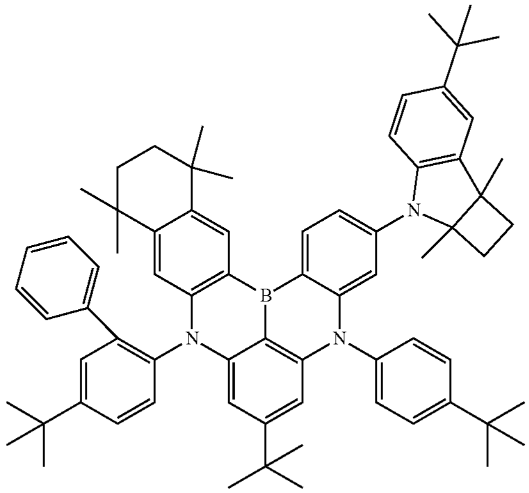
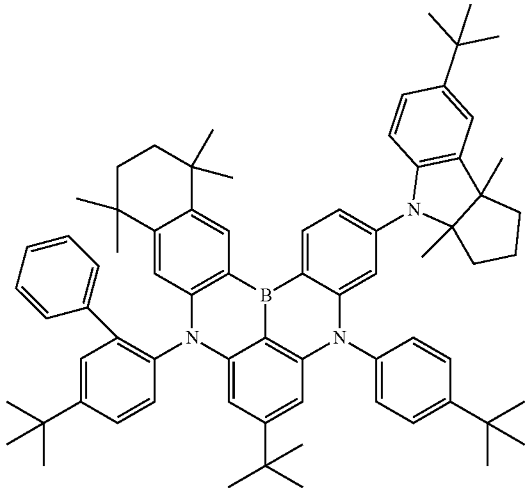
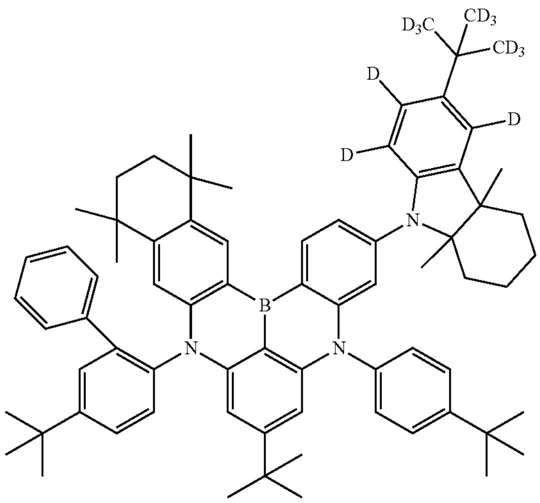
-continued
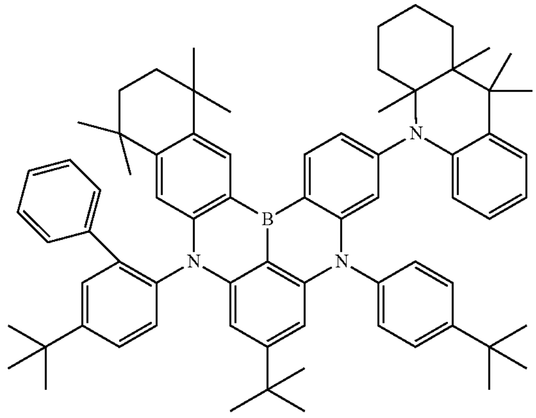
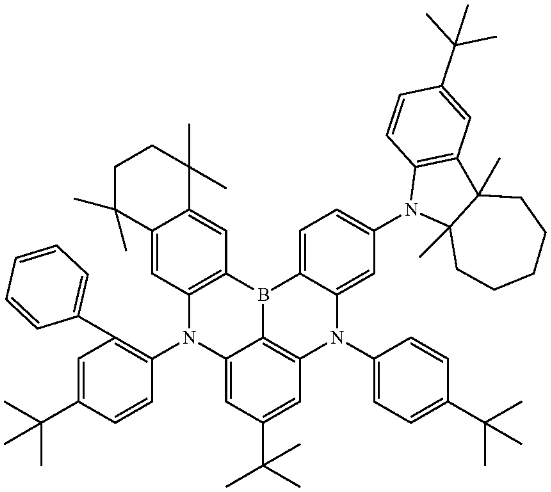
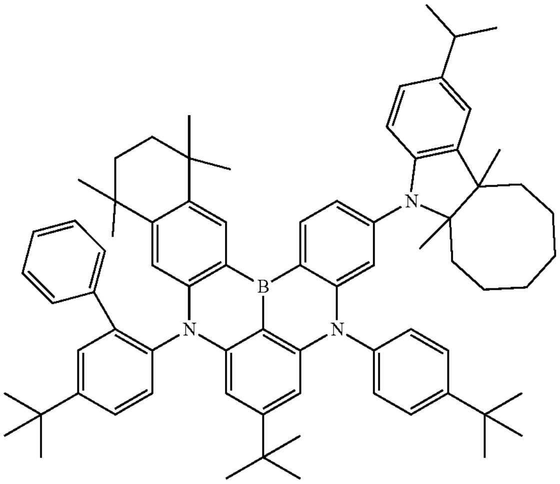

-continued
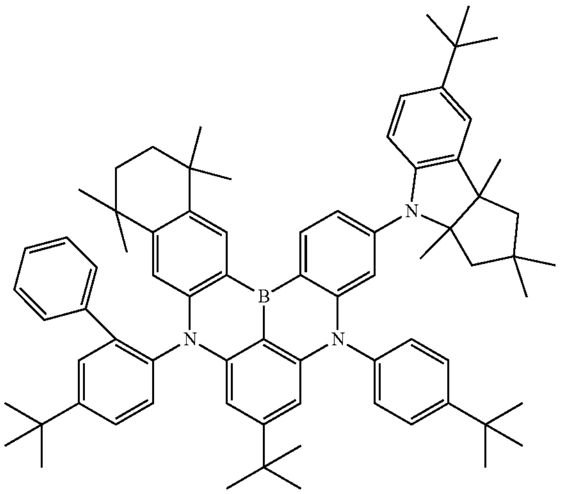
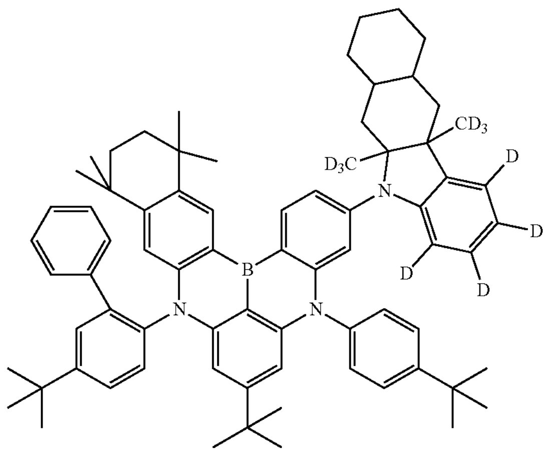
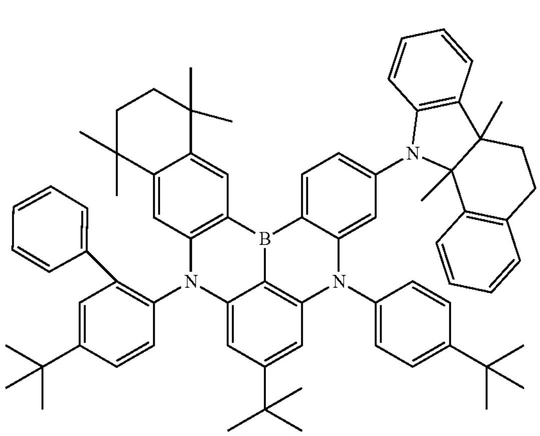
-continued
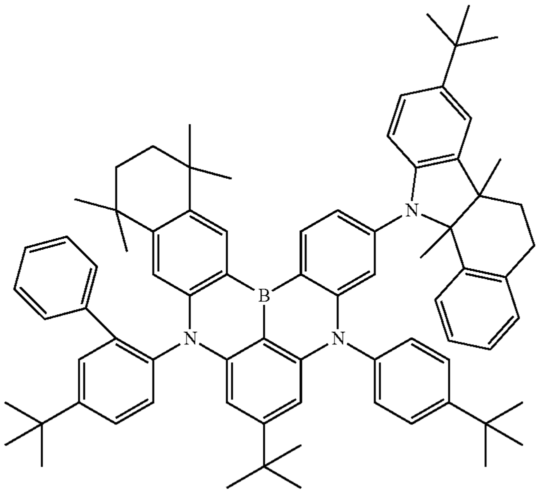
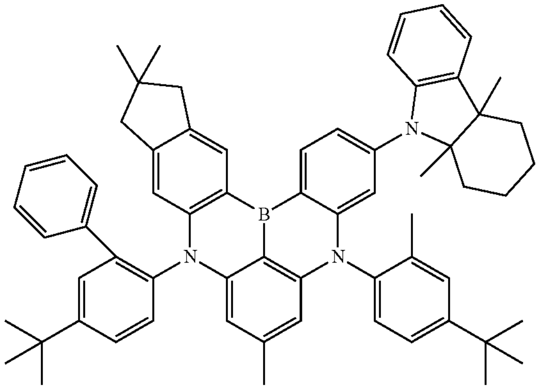
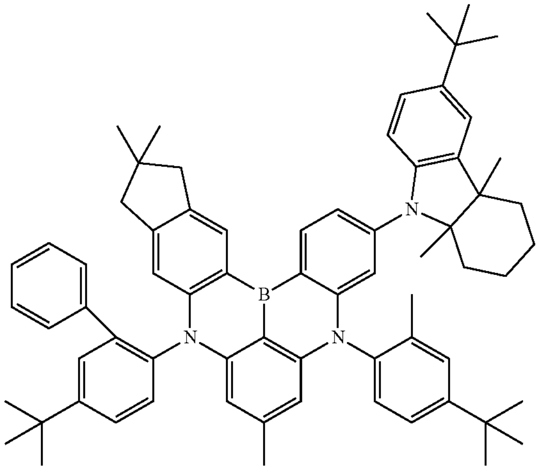

-continued
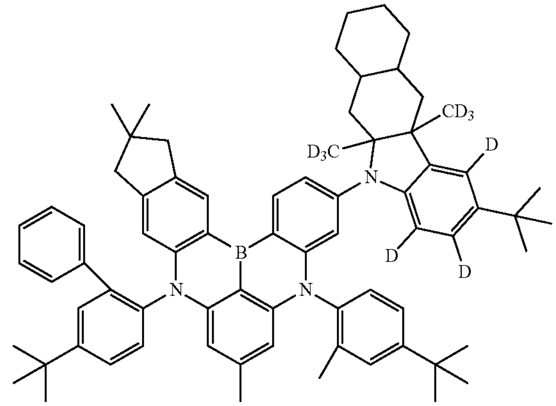
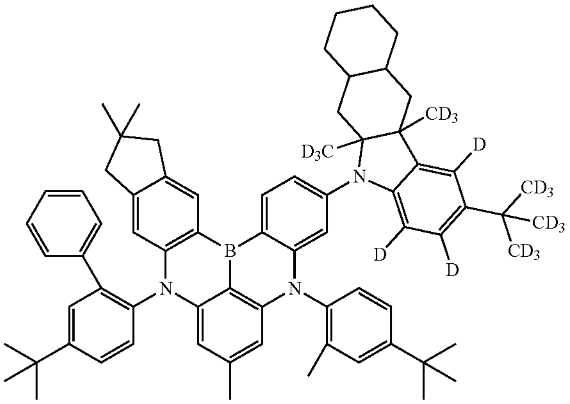
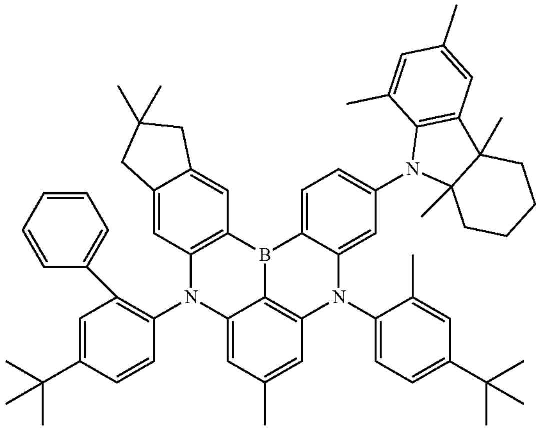
-continued
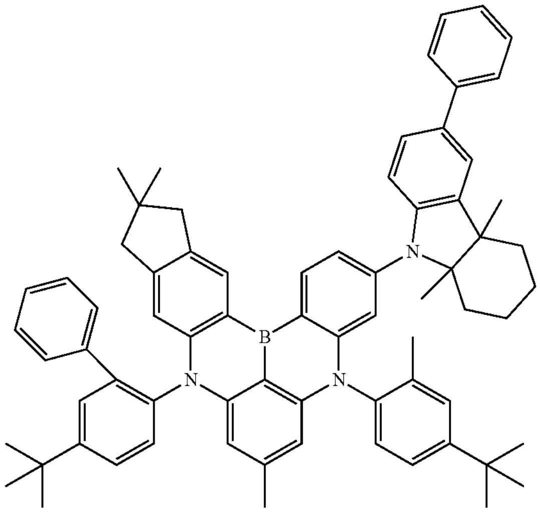
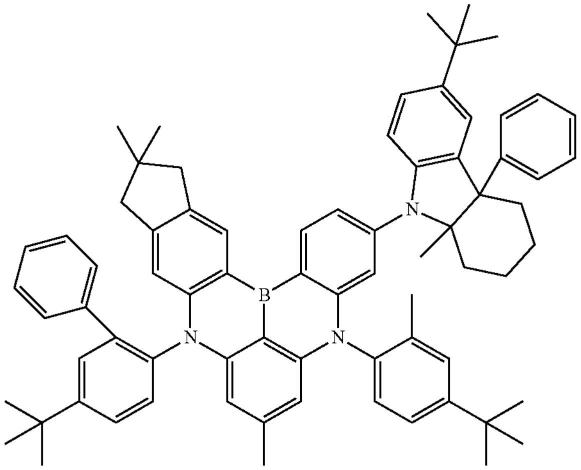
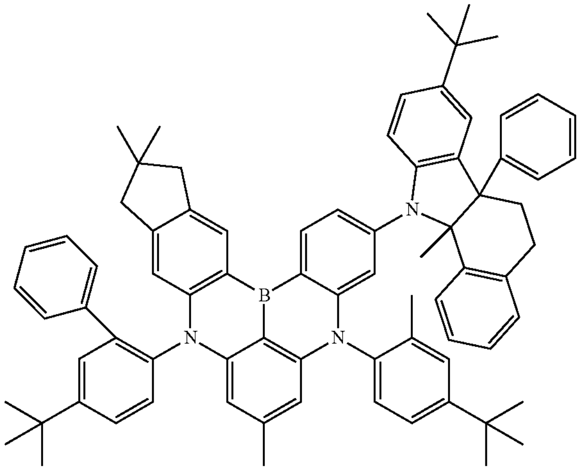

-continued
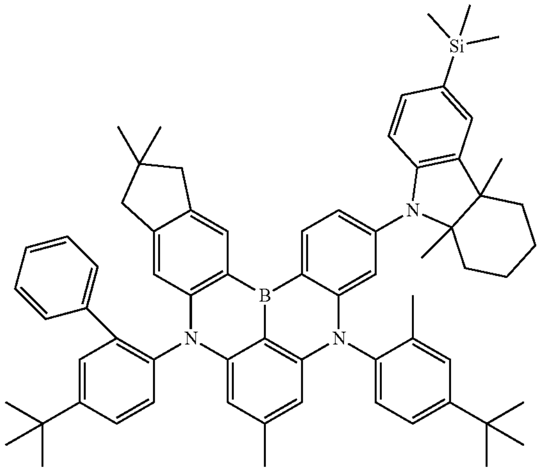
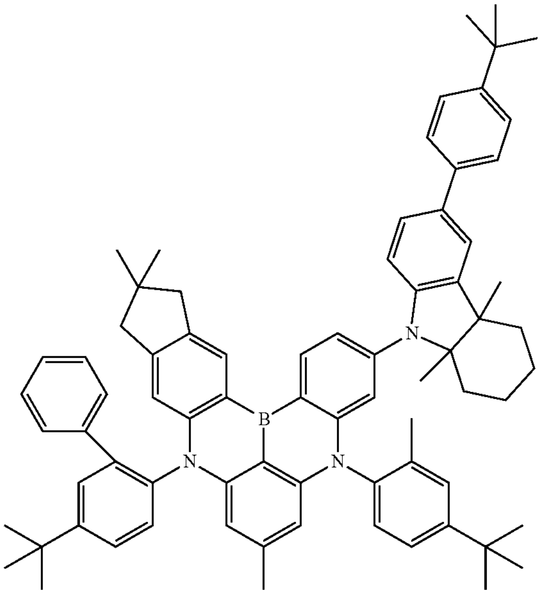
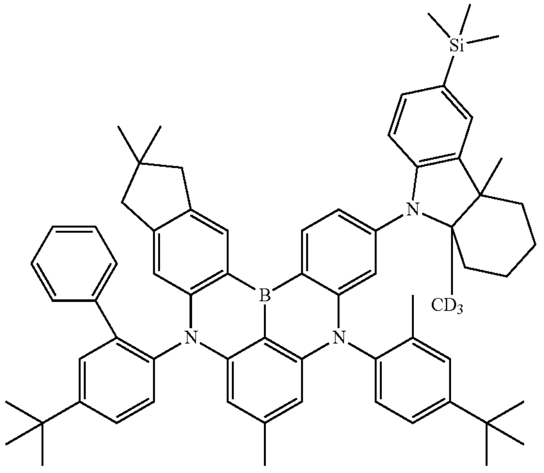
-continued
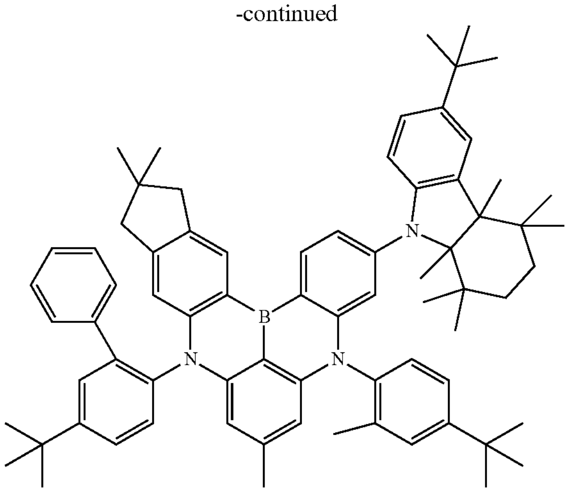
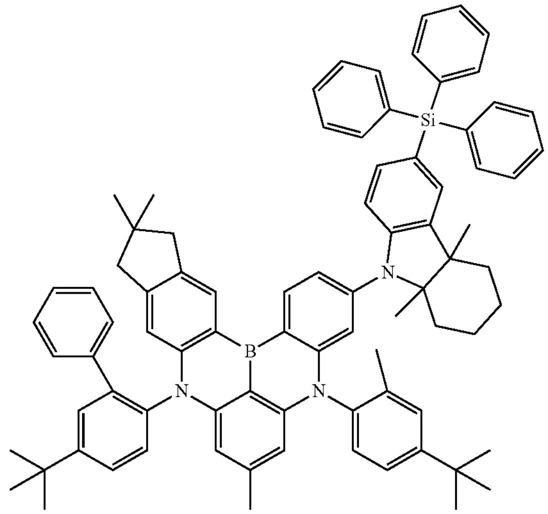
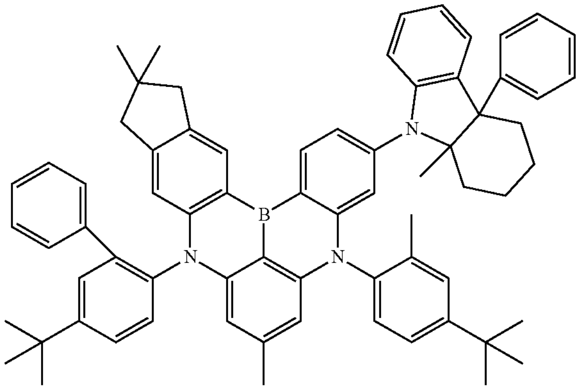
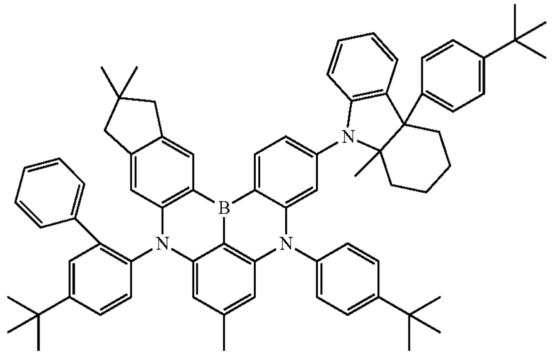

-continued
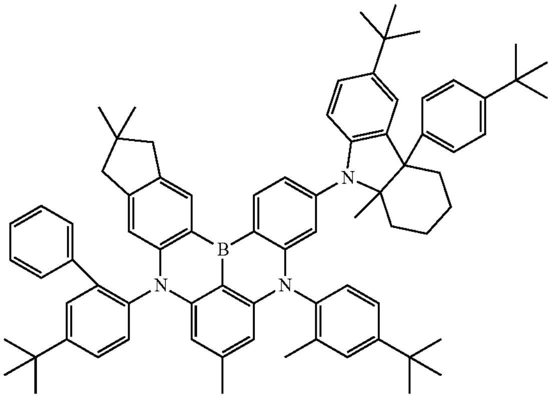
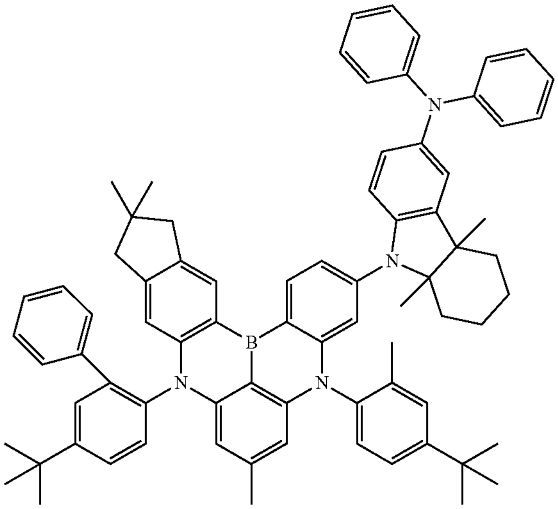
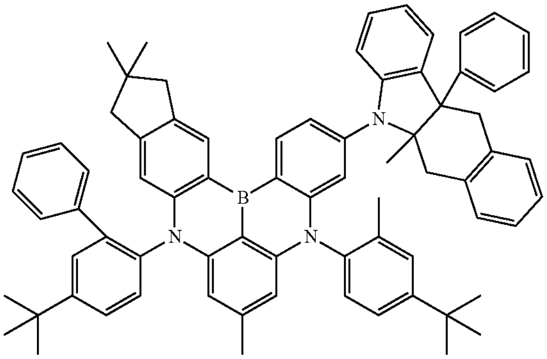
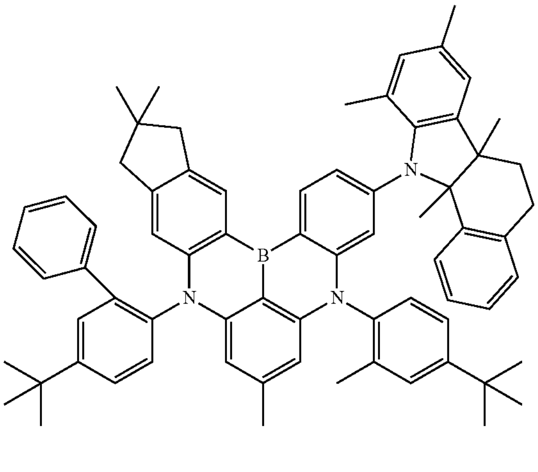
-continued
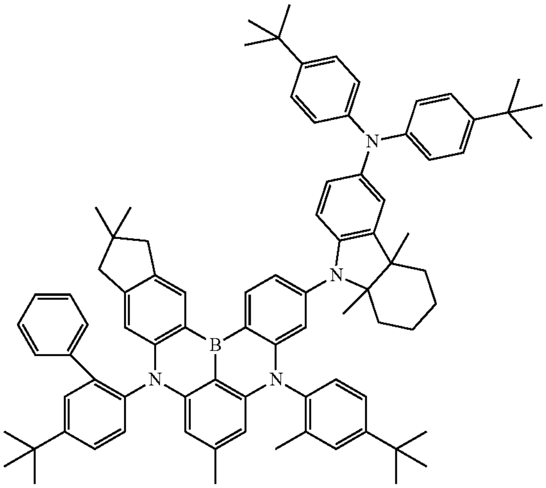
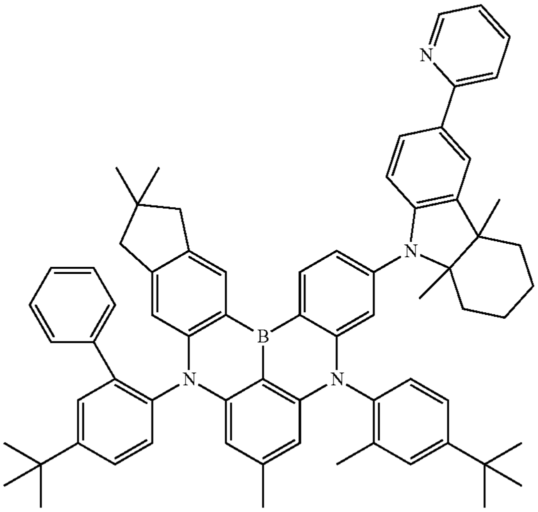
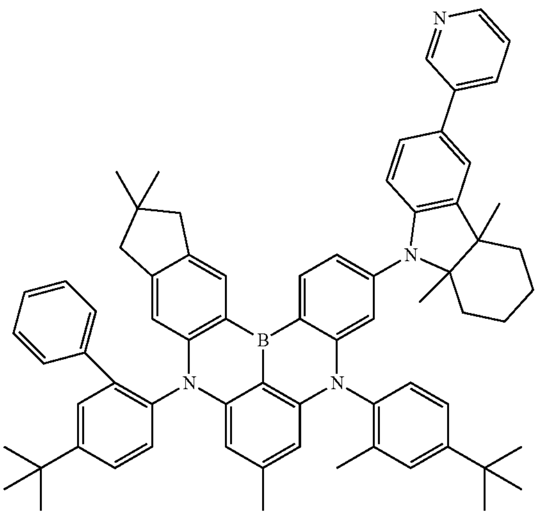

-continued
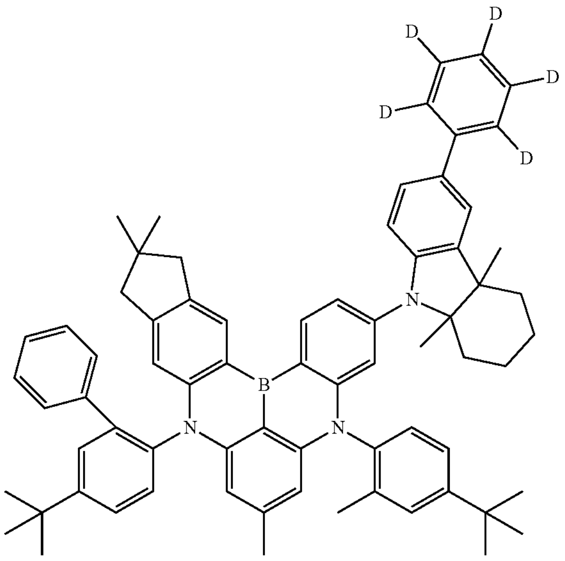
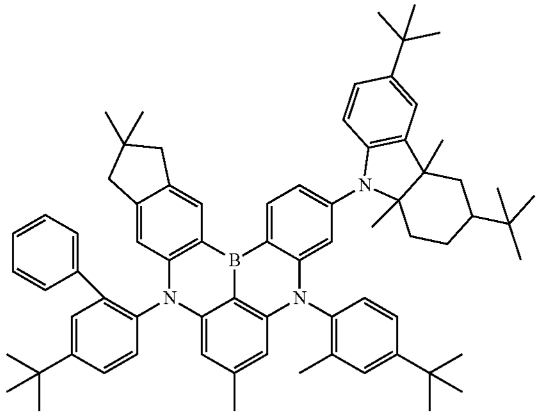
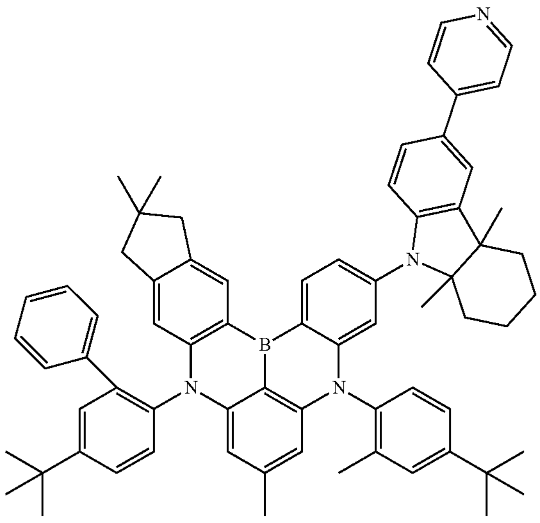
-continued
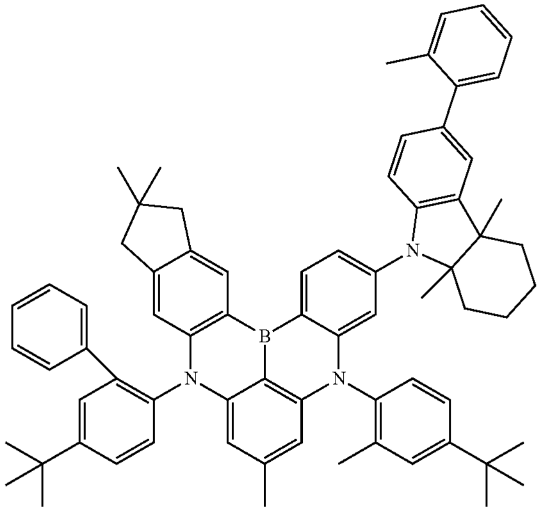
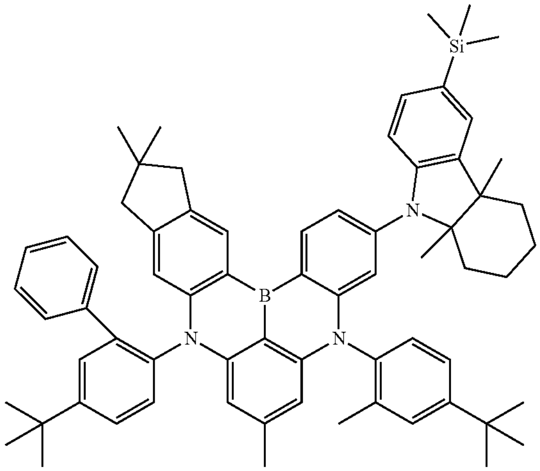
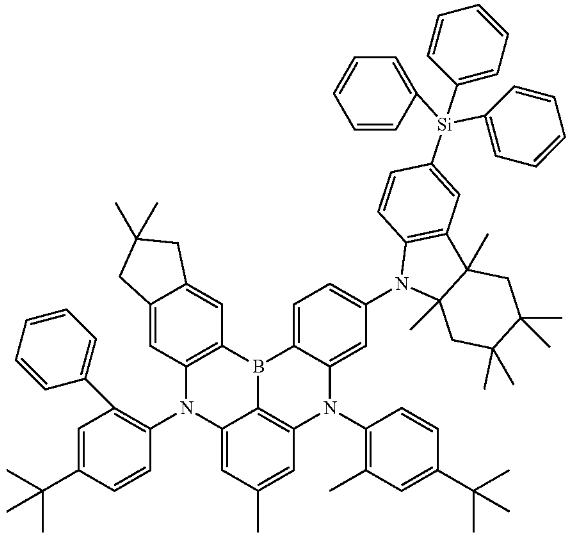

-continued
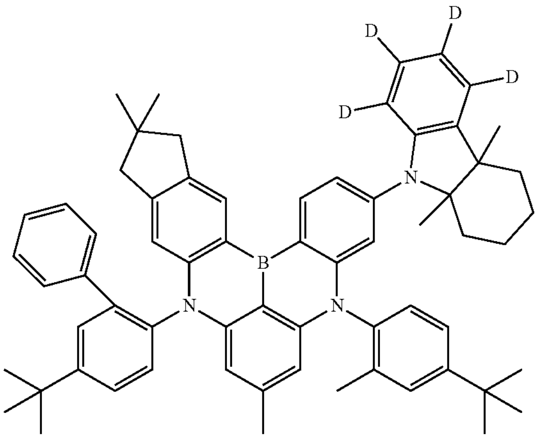
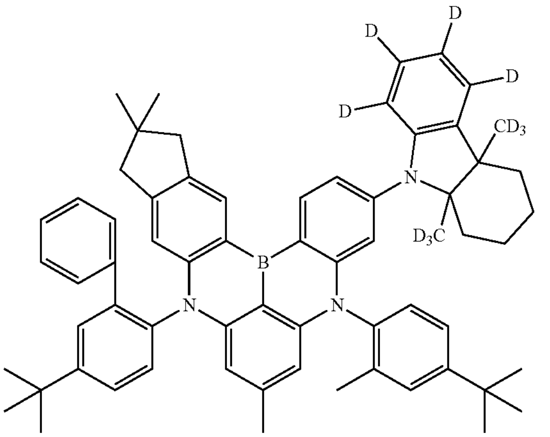
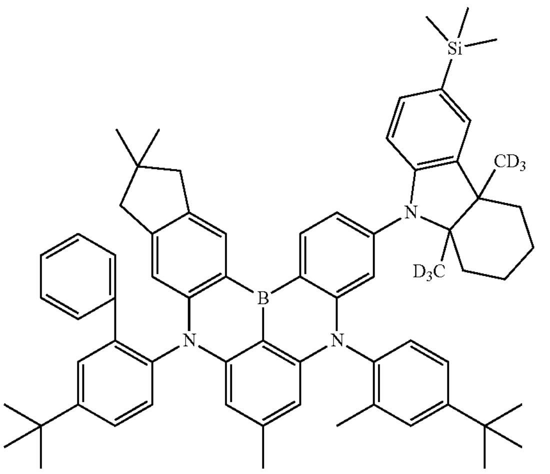
-continued
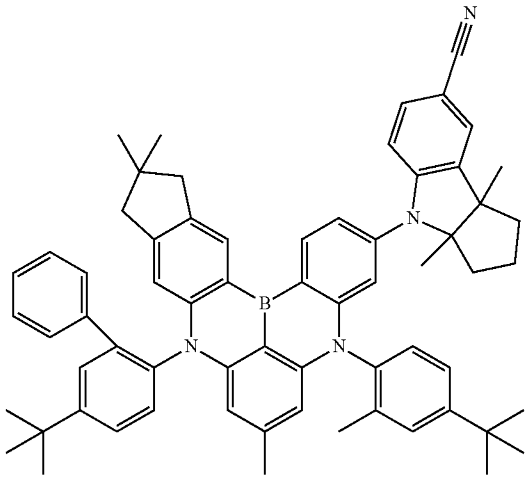
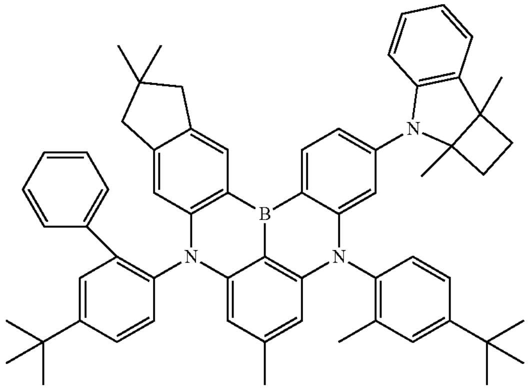
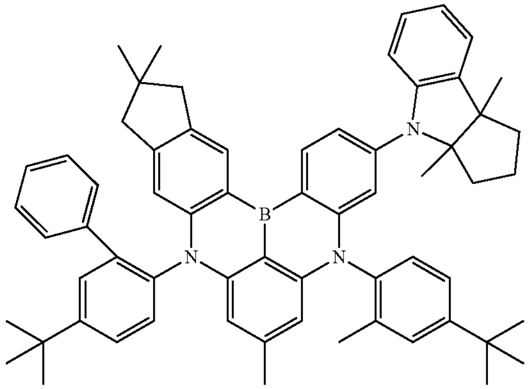
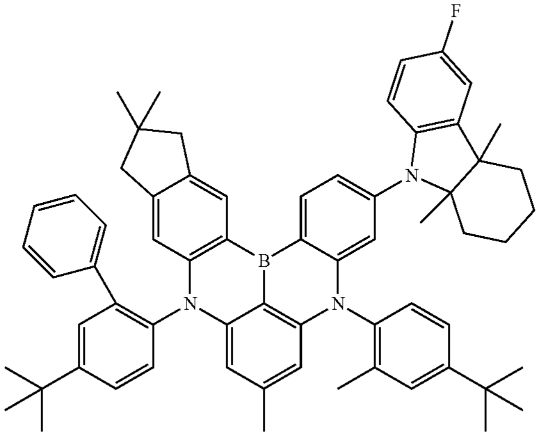

-continued
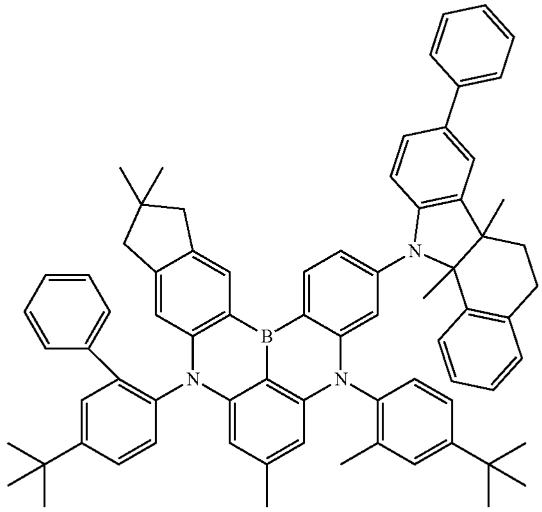
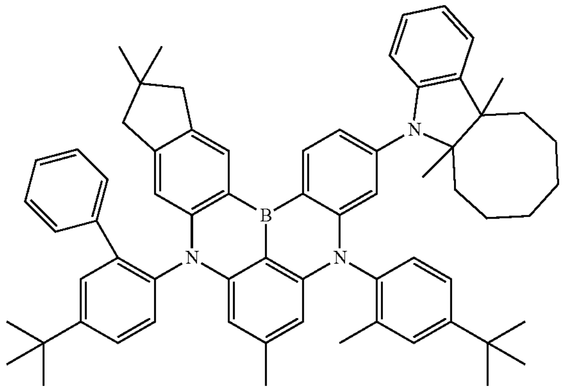
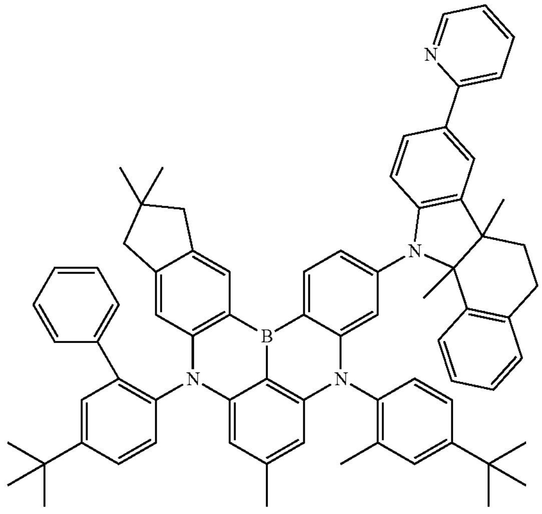
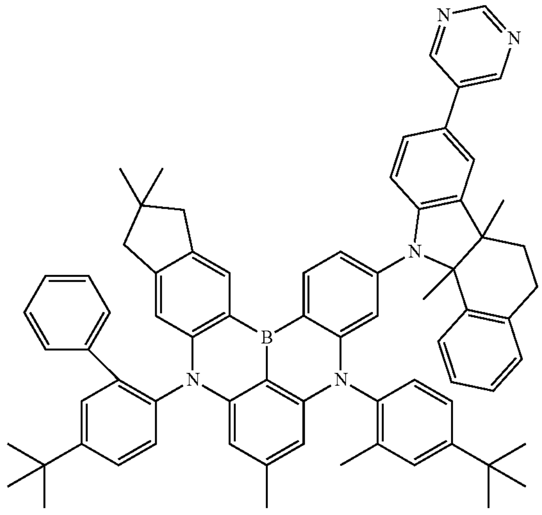
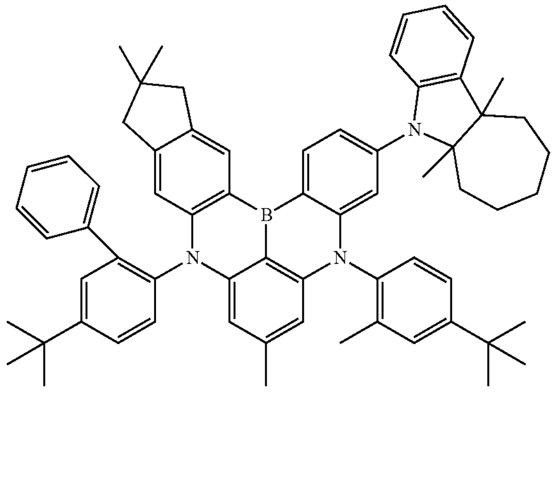
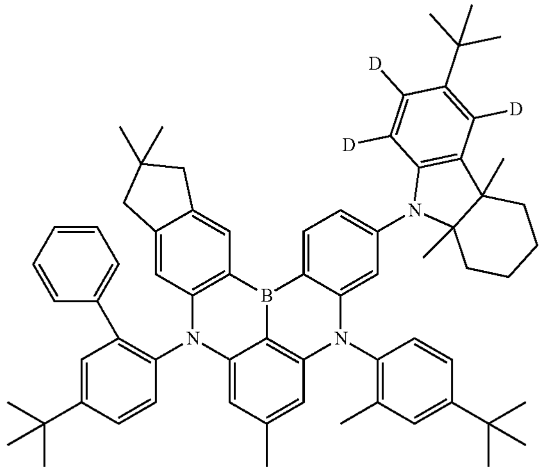
-continued -continued
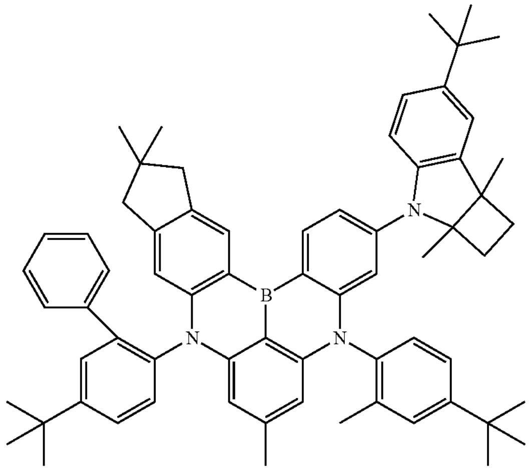
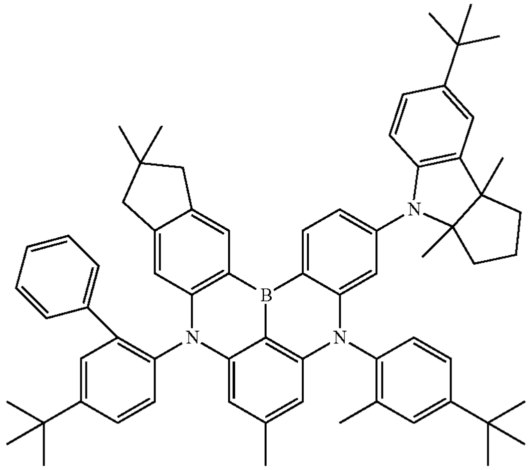
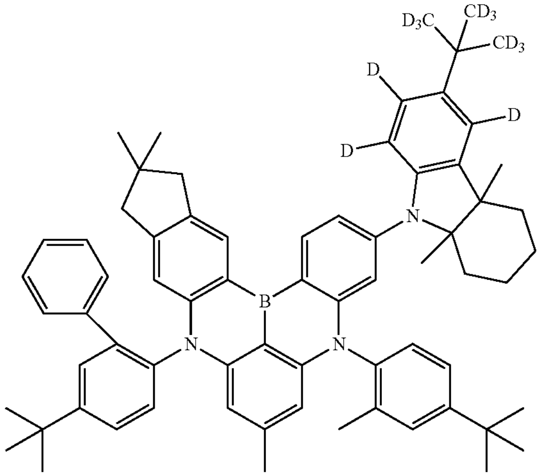
-continued
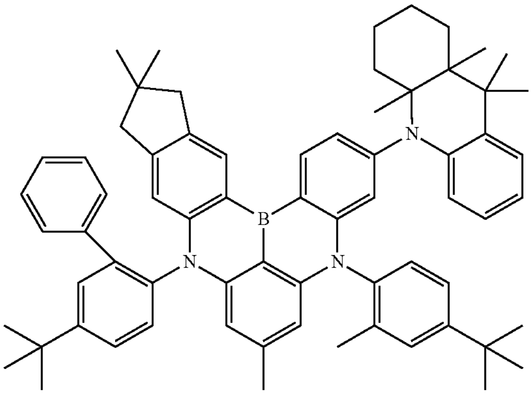
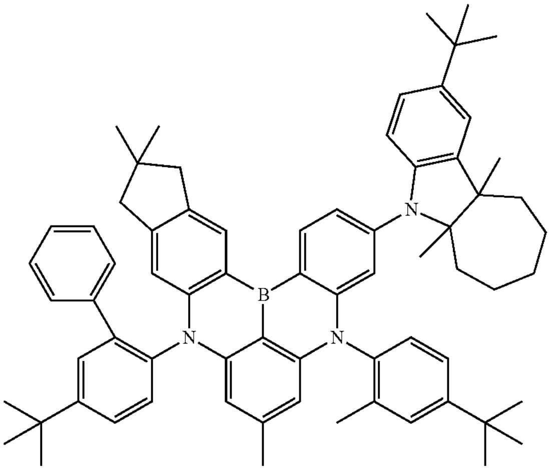
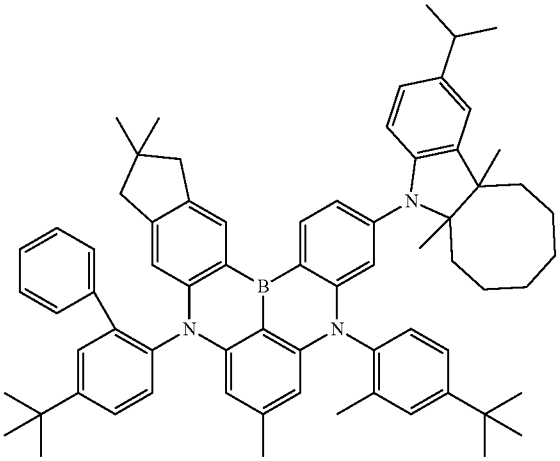

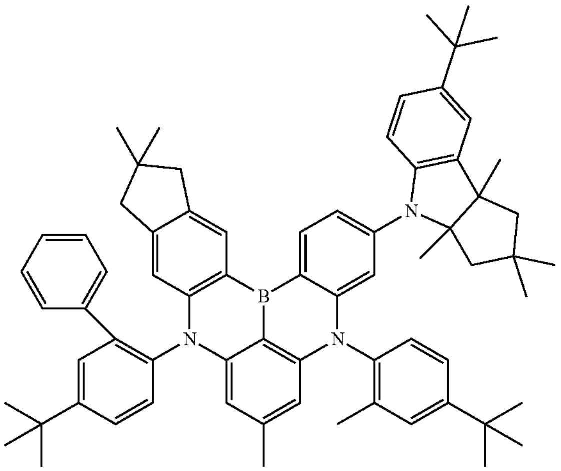
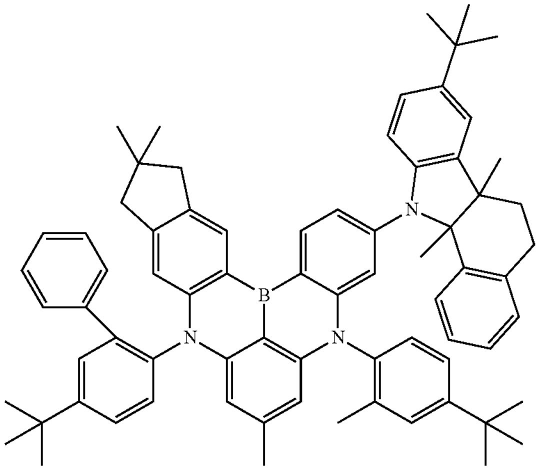
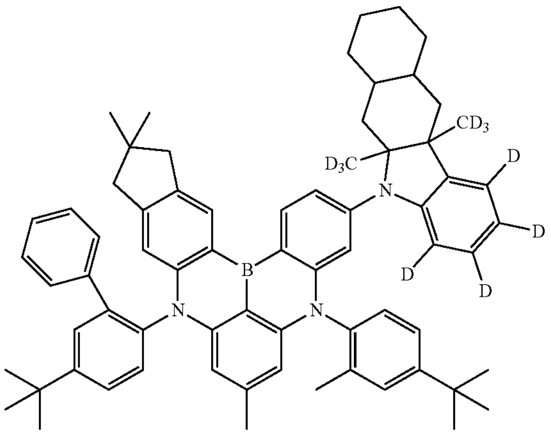
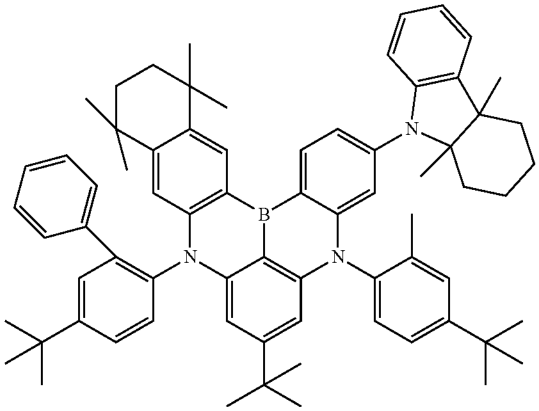
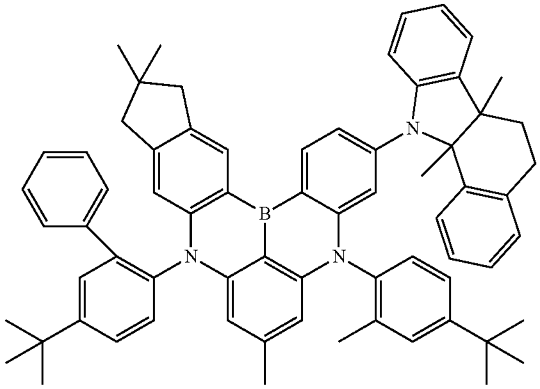
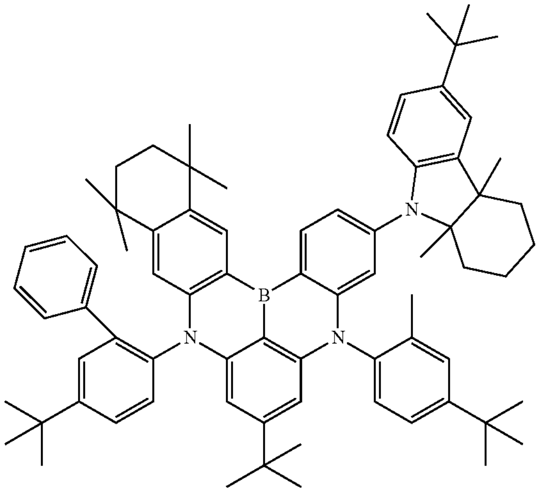

-continued
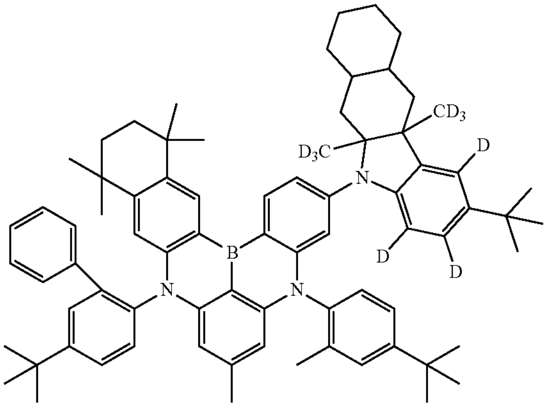
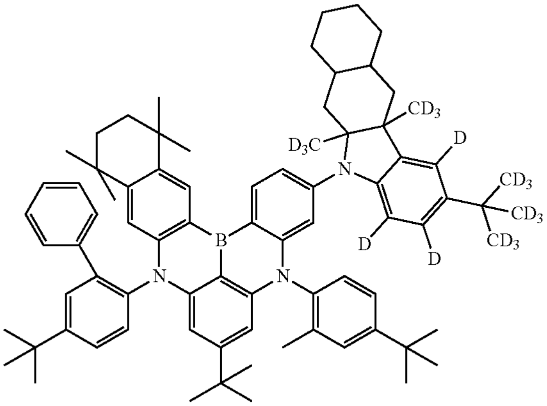
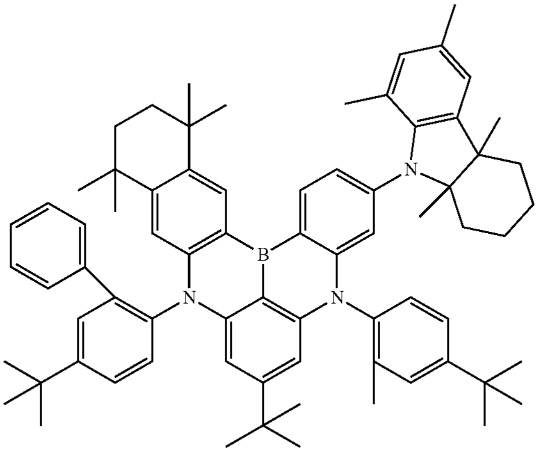
-continued
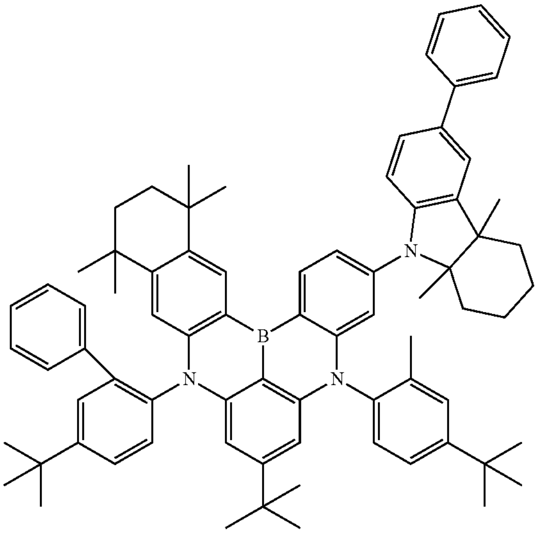
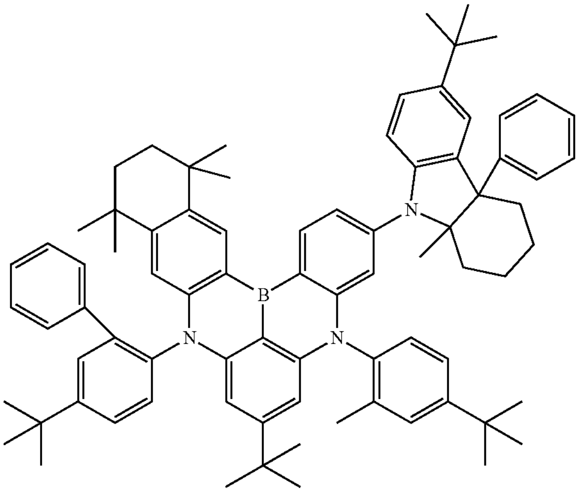
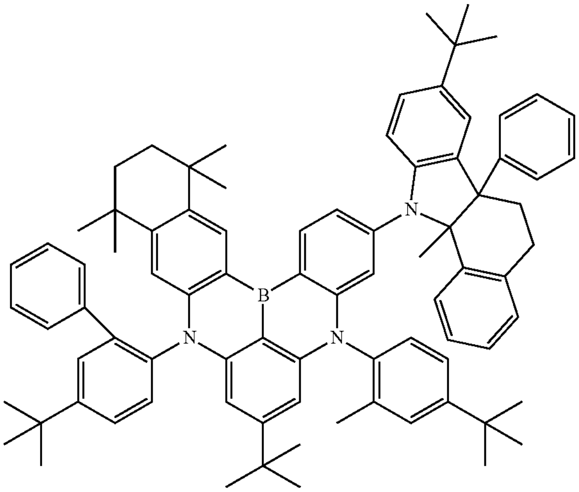

-continued
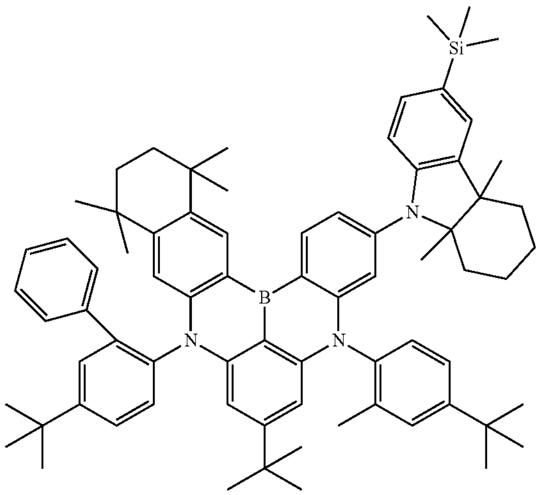
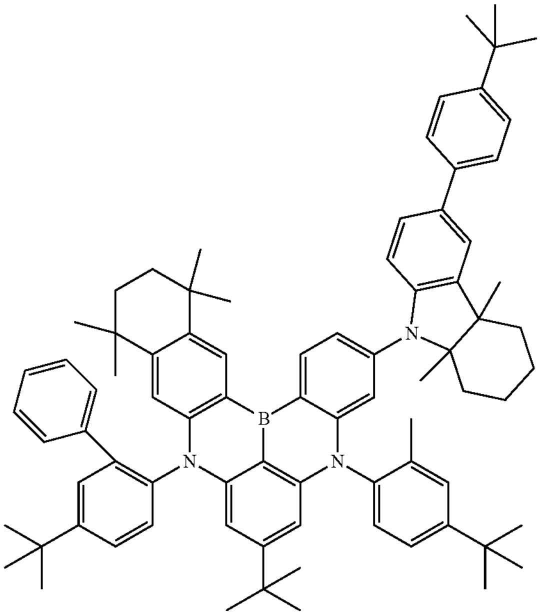
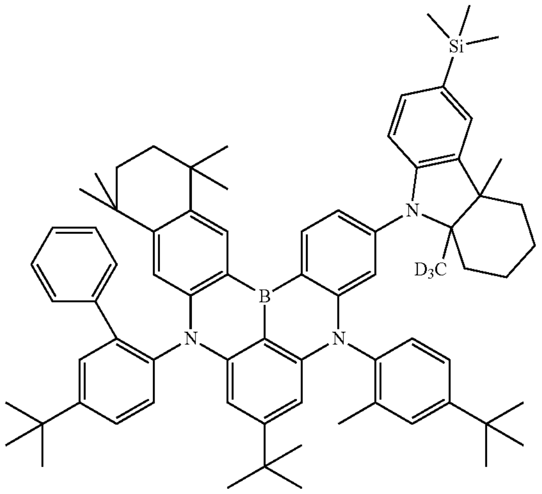
-continued
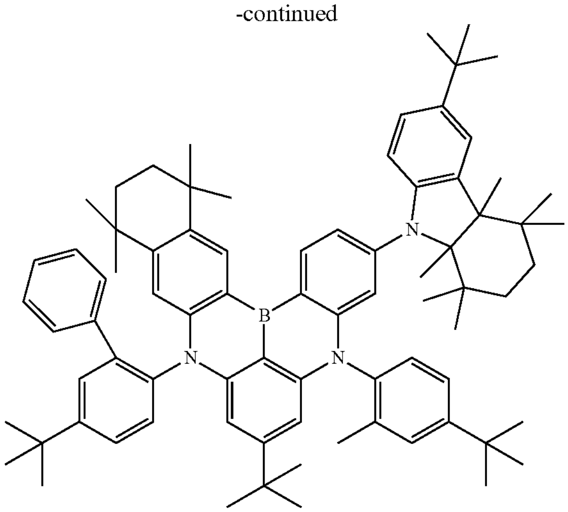
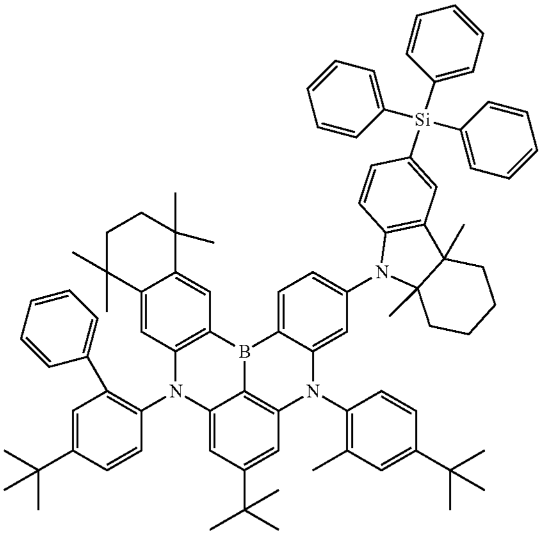
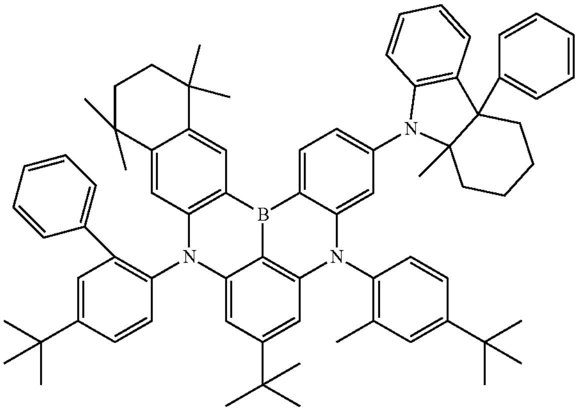

-continued
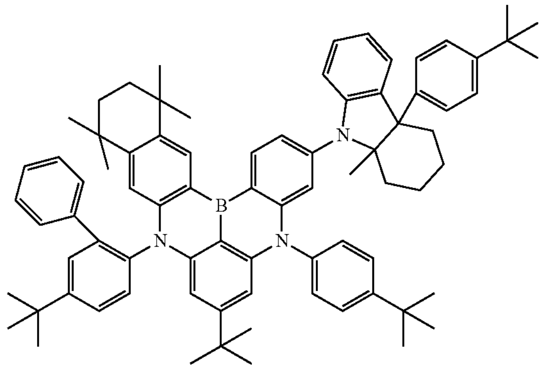
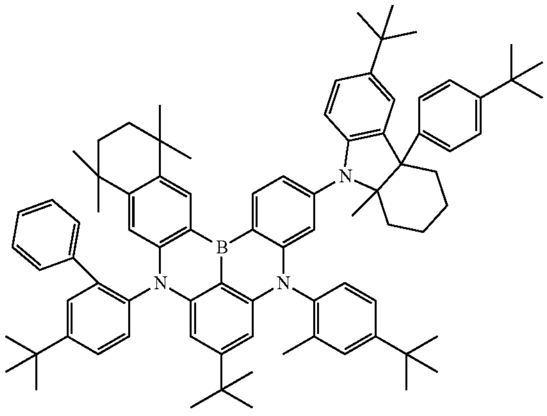
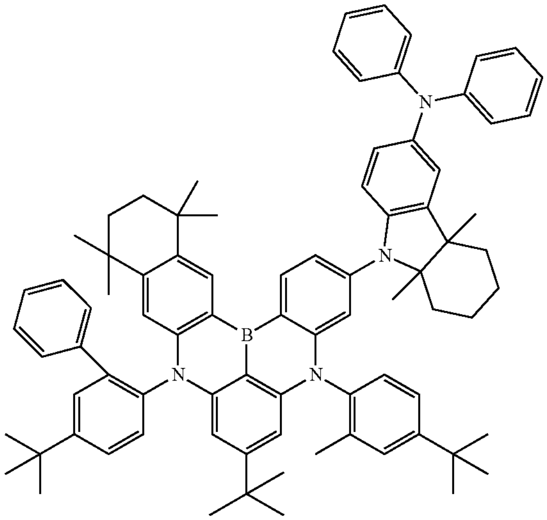
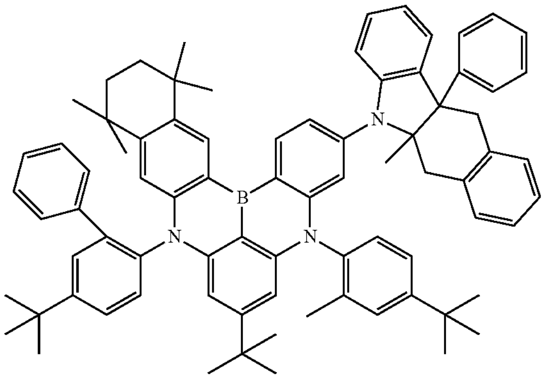
-continued
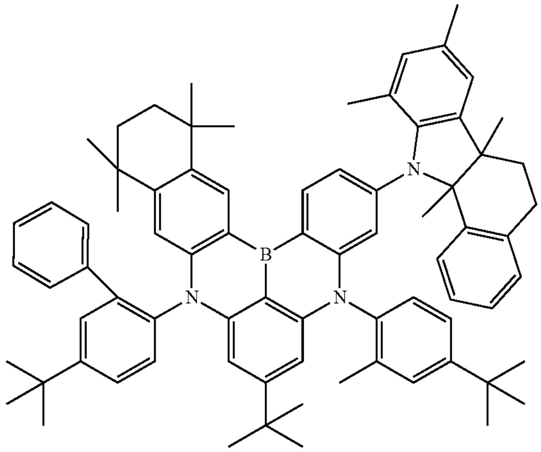
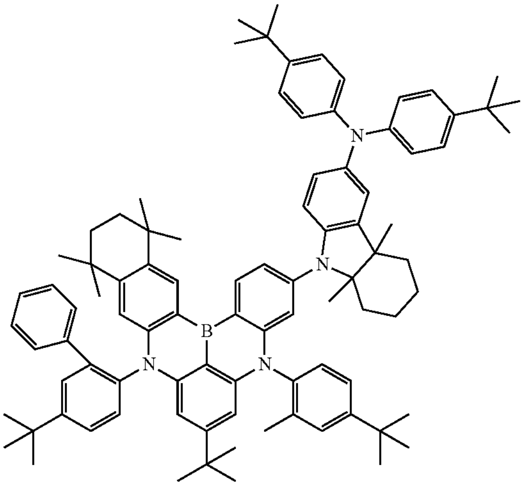
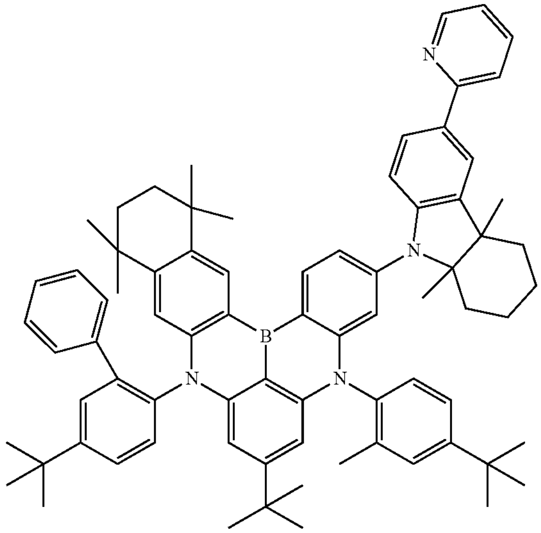

-continued
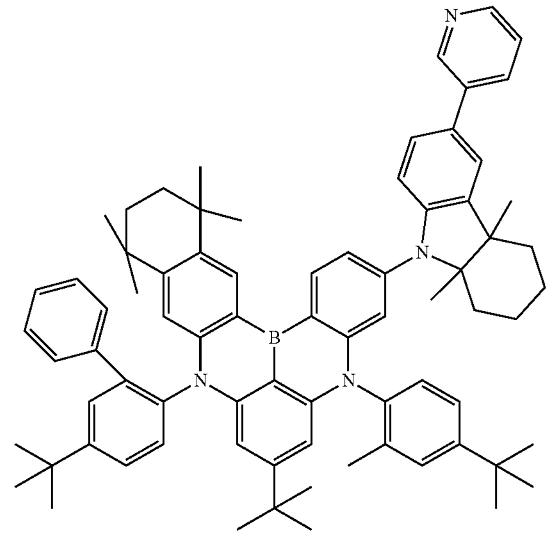
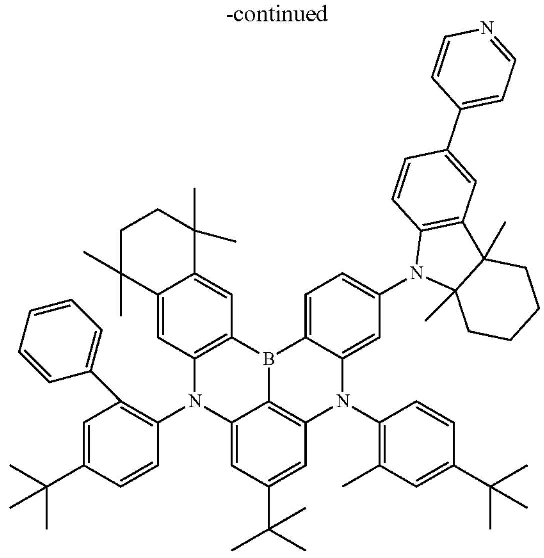
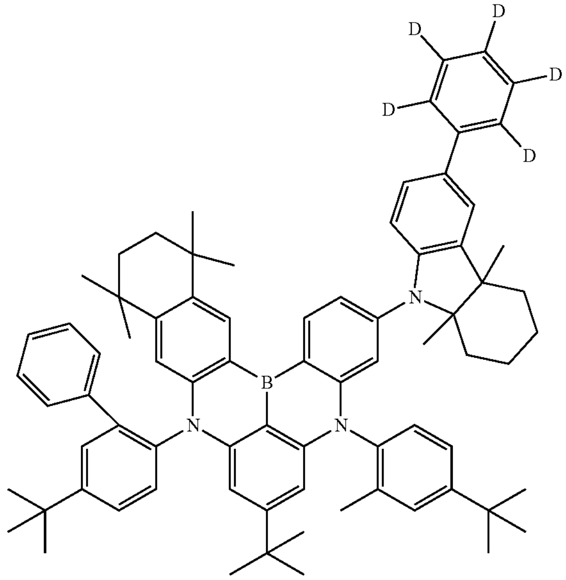
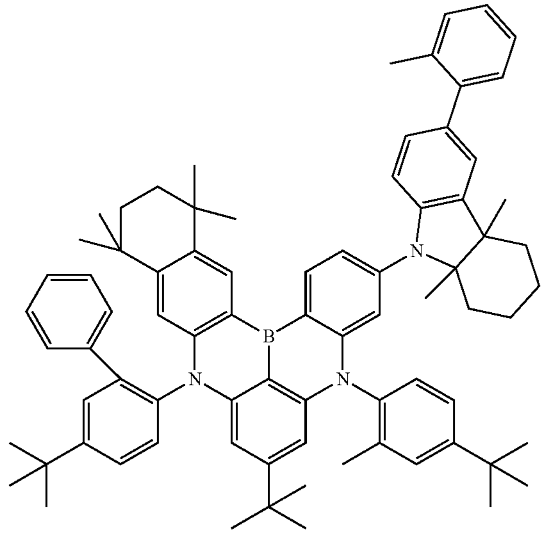
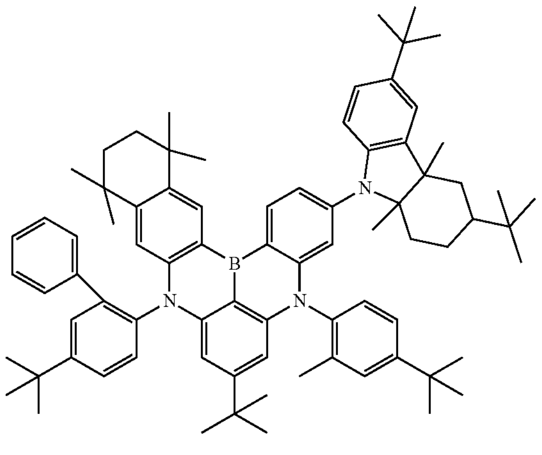
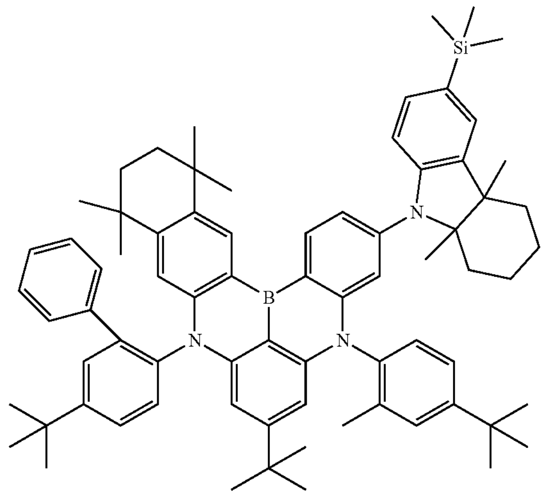
-continued -continued
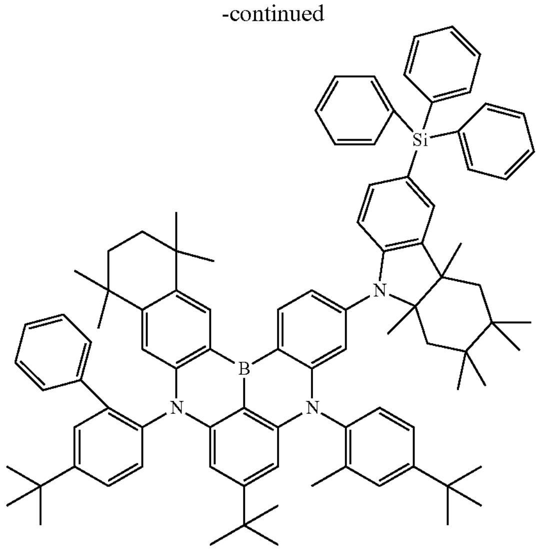
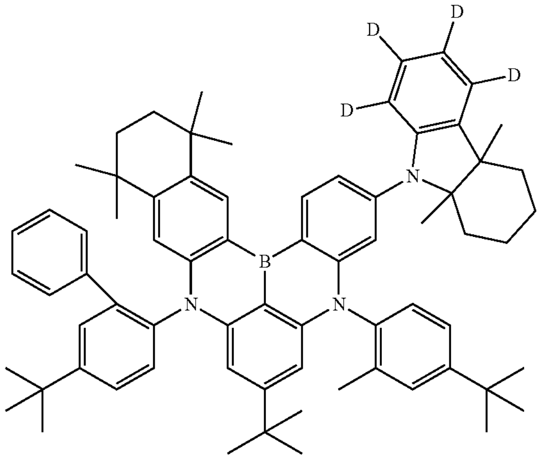
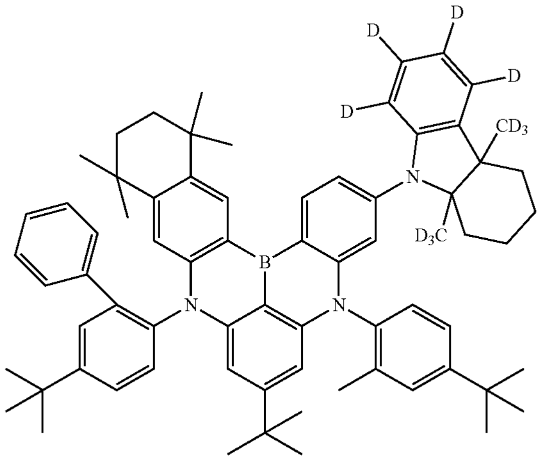
-continued
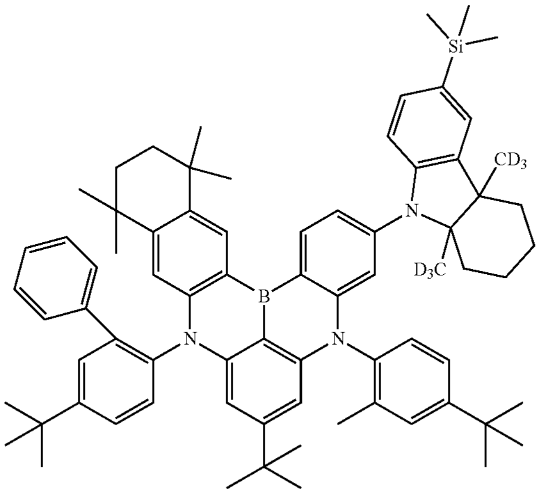
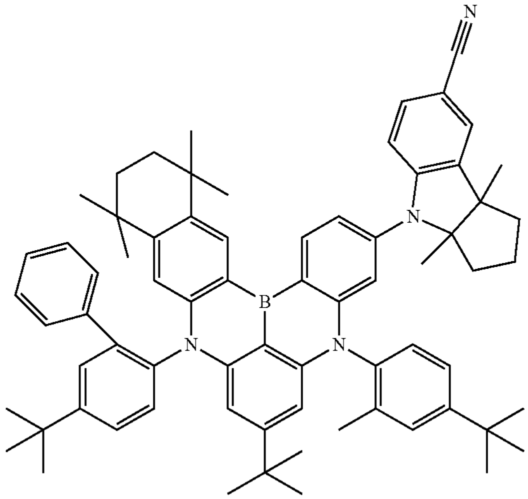
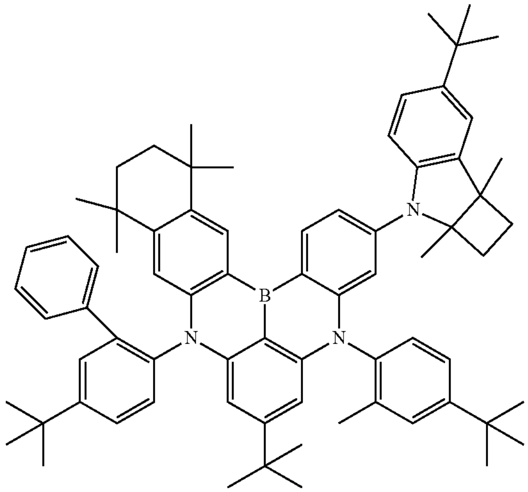

-continued
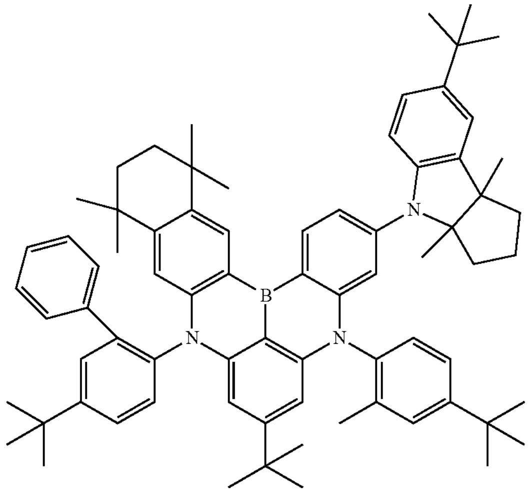
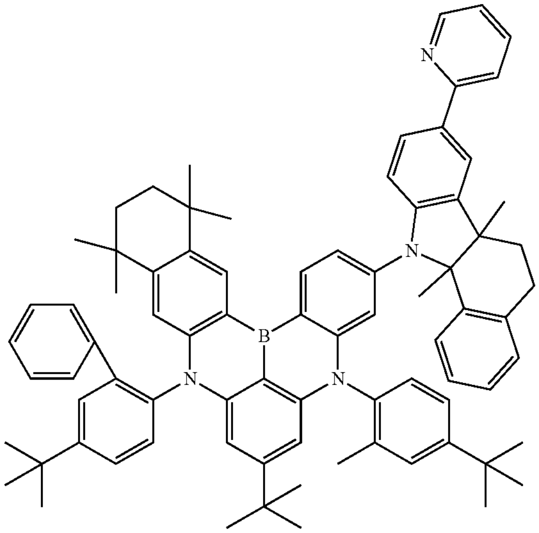
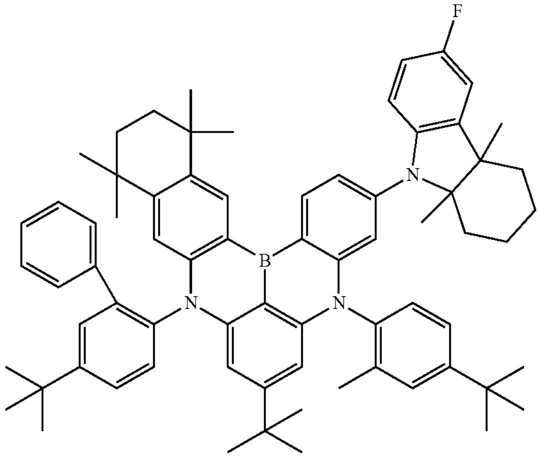
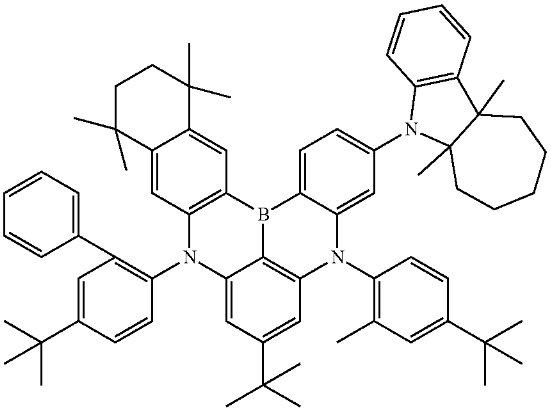
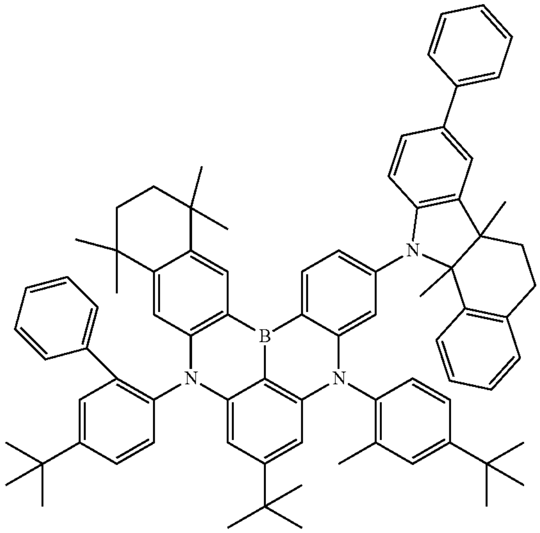
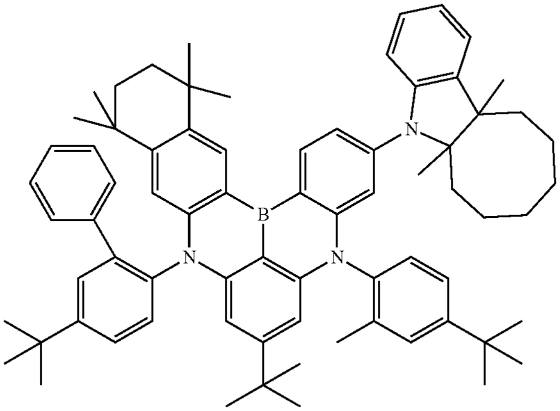
-continued -continued
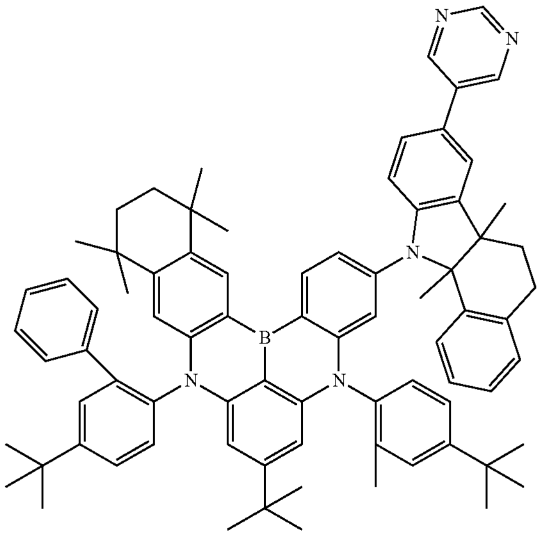
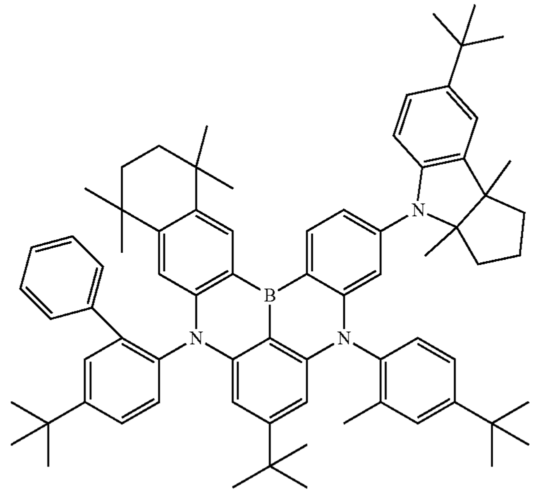
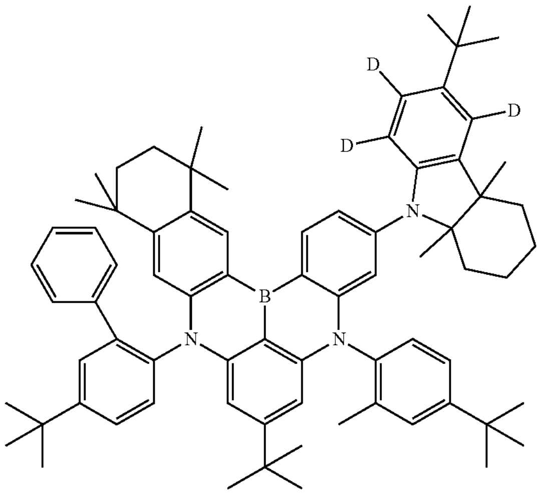
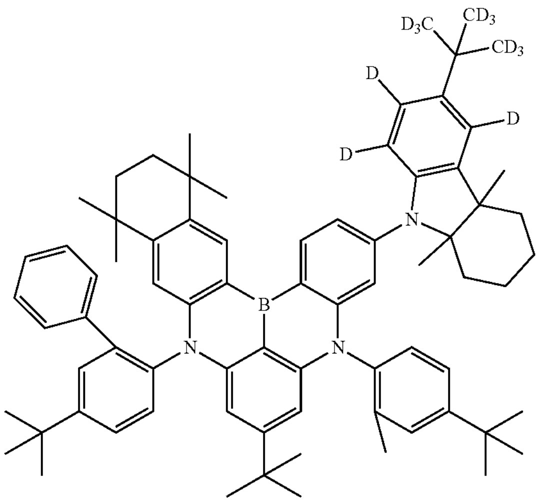
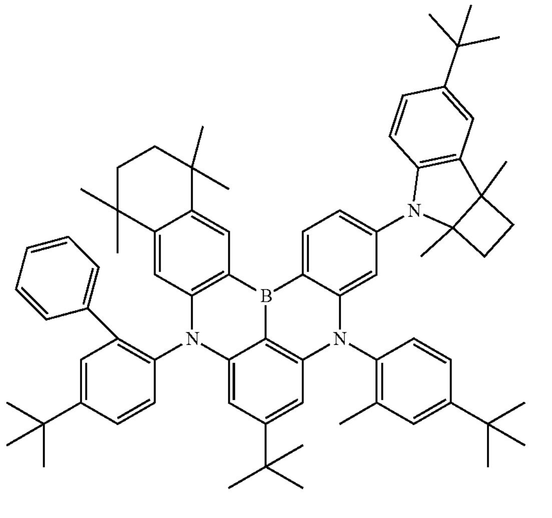
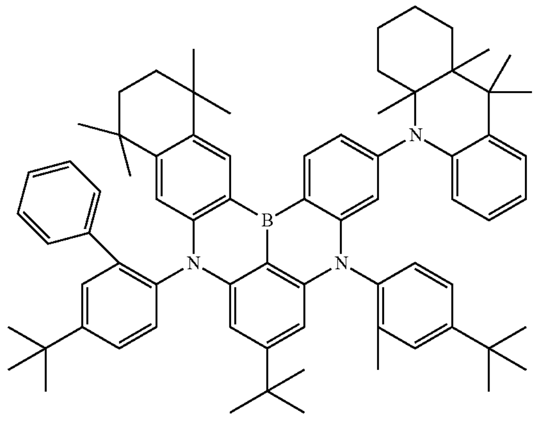
-continued -continued
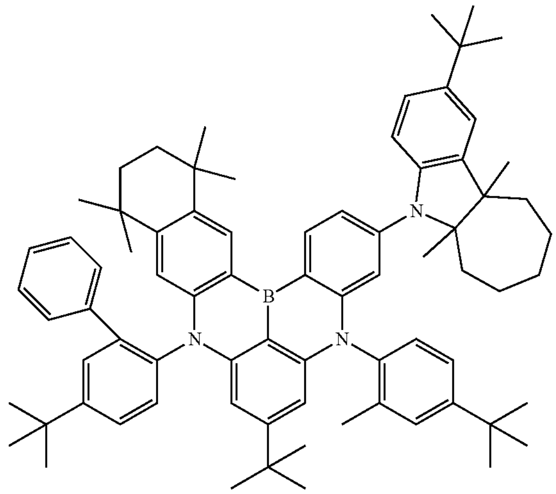
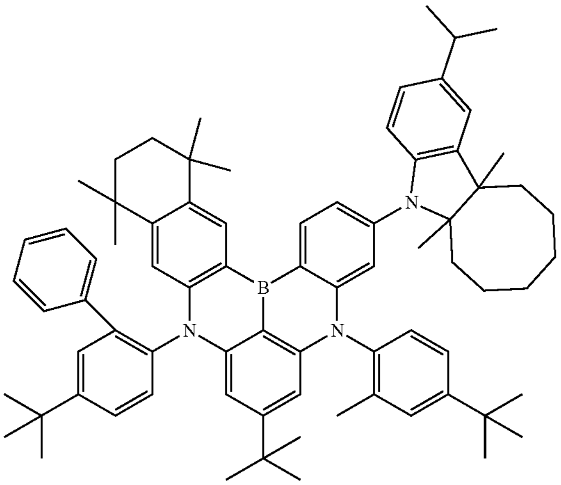
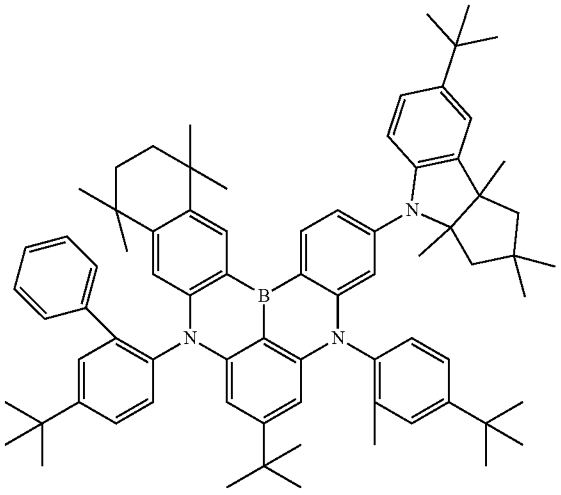
-continued
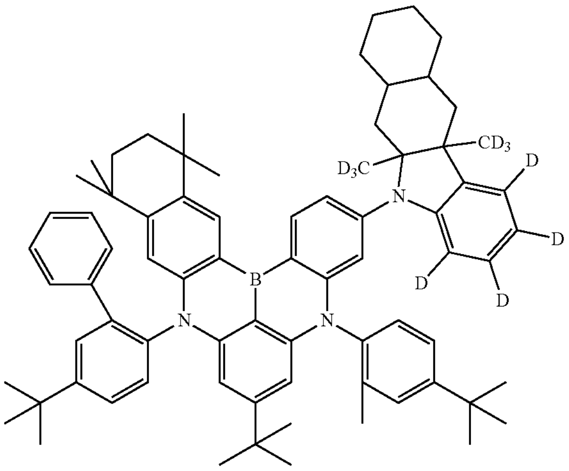
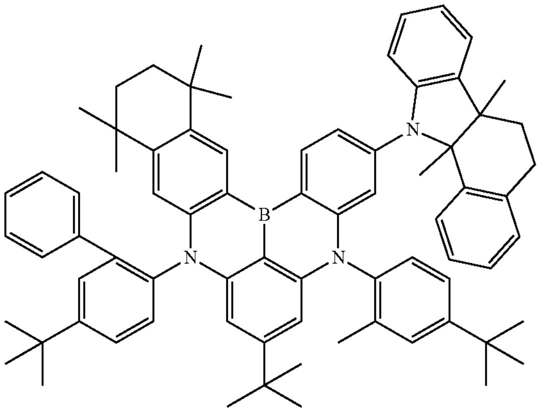
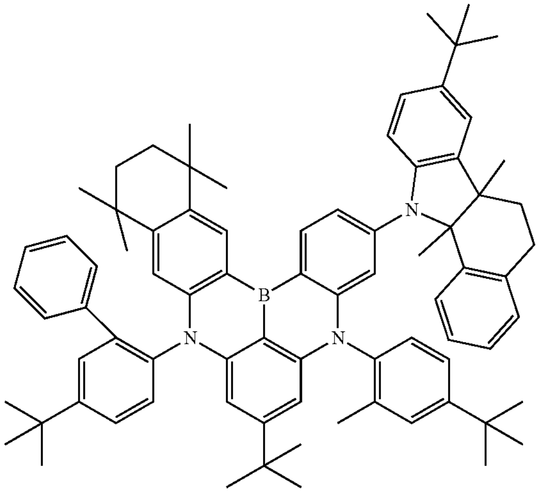

-continued
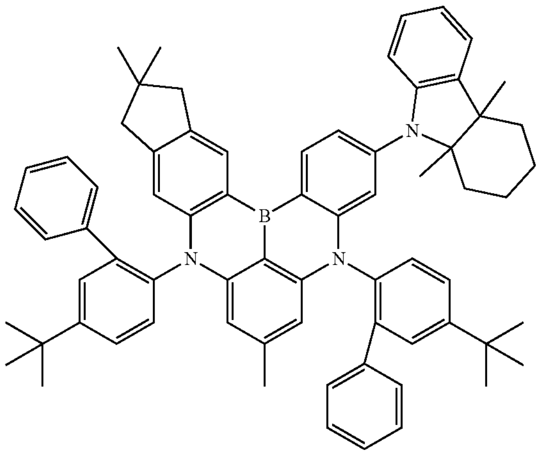
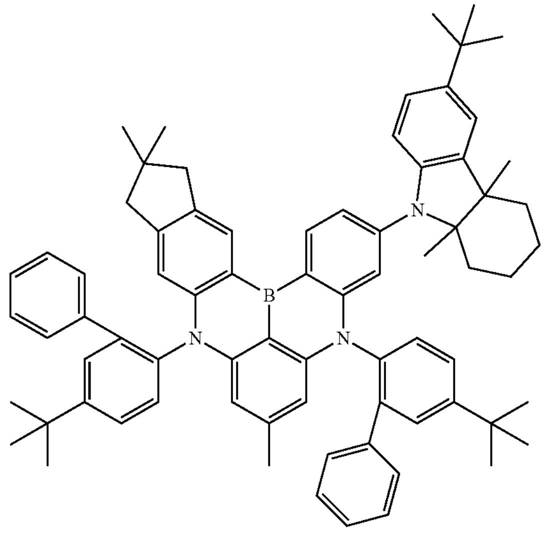
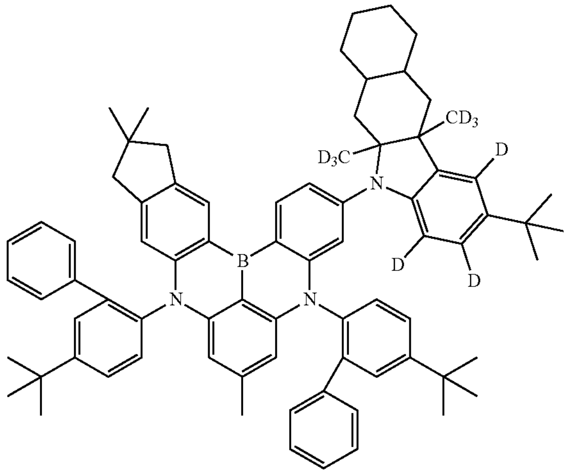
-continued
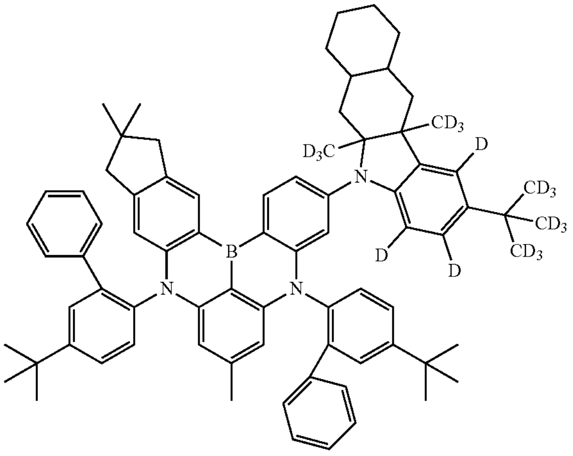
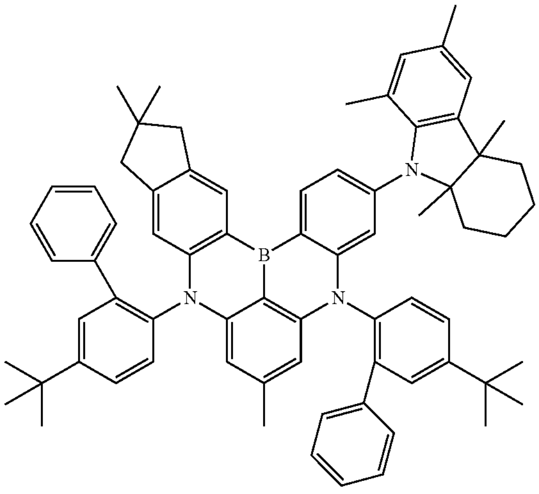
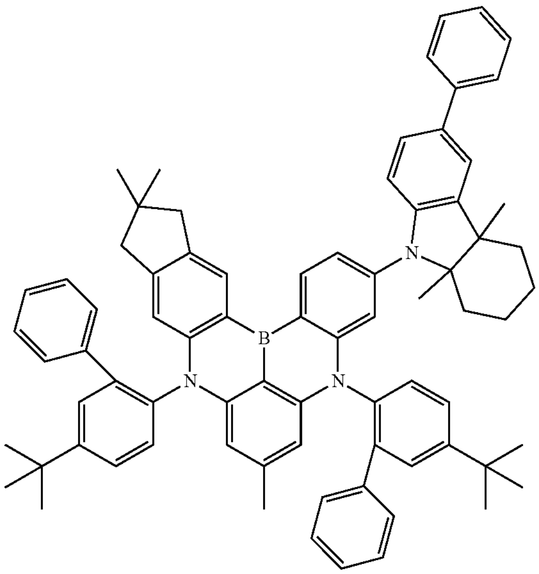

-continued
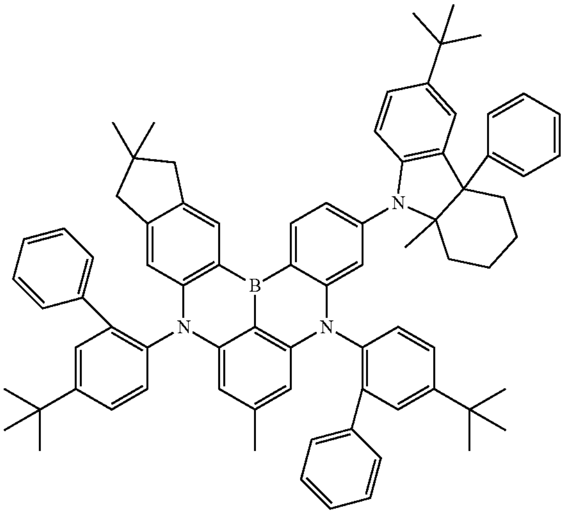
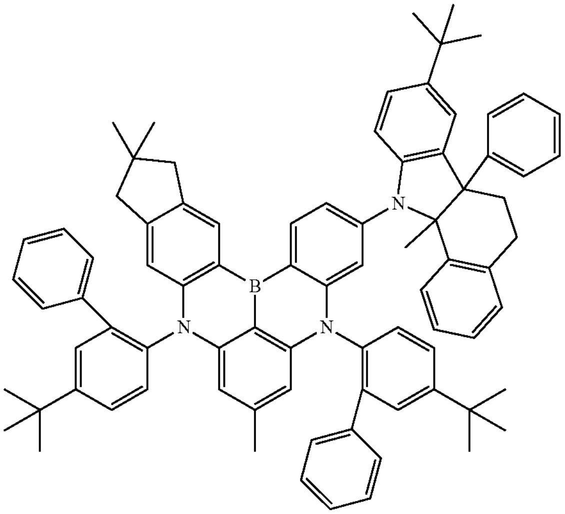
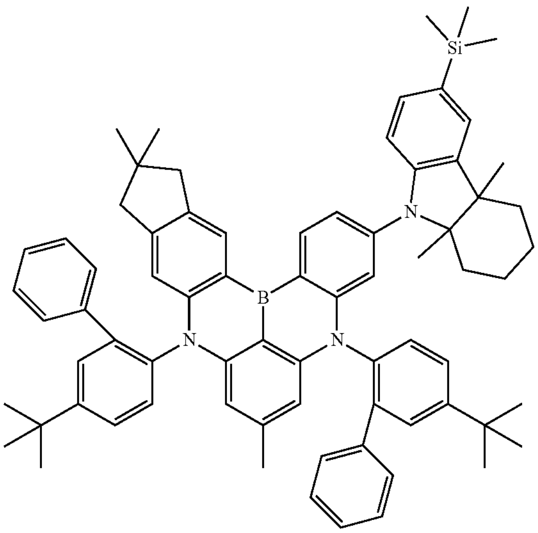
-continued
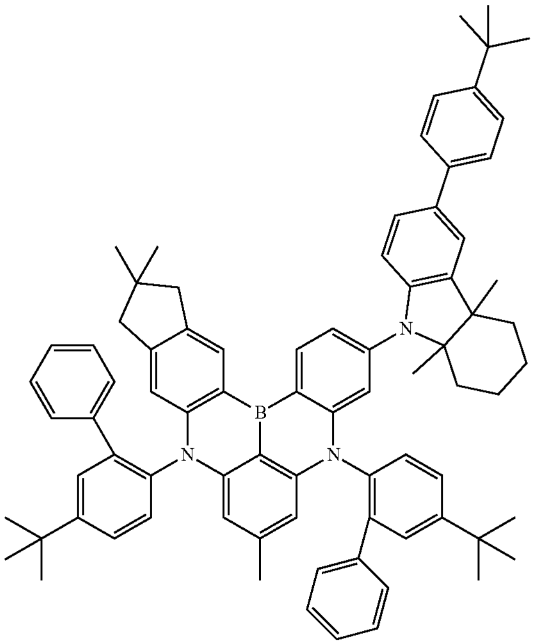
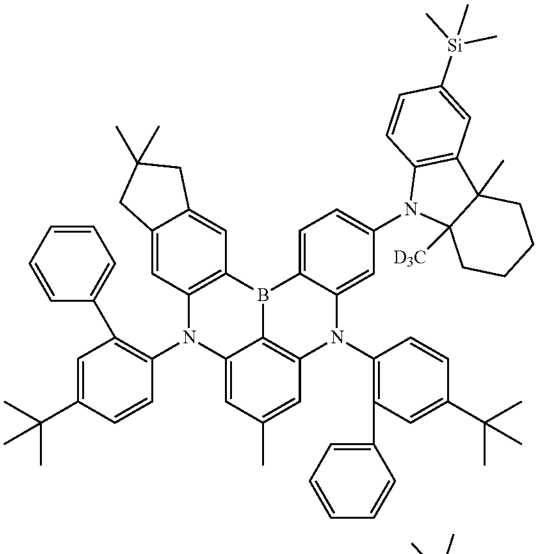
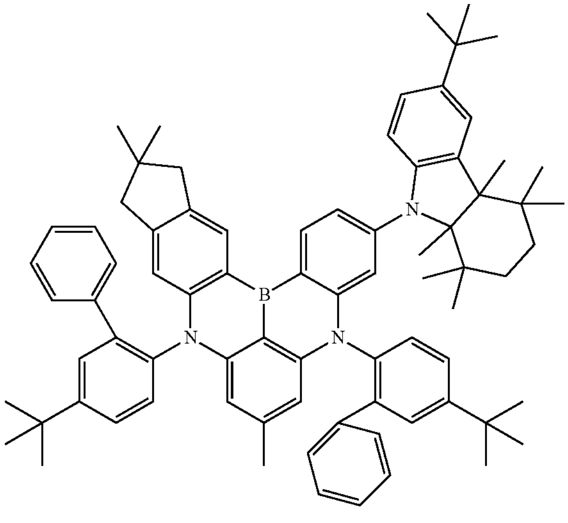

-continued
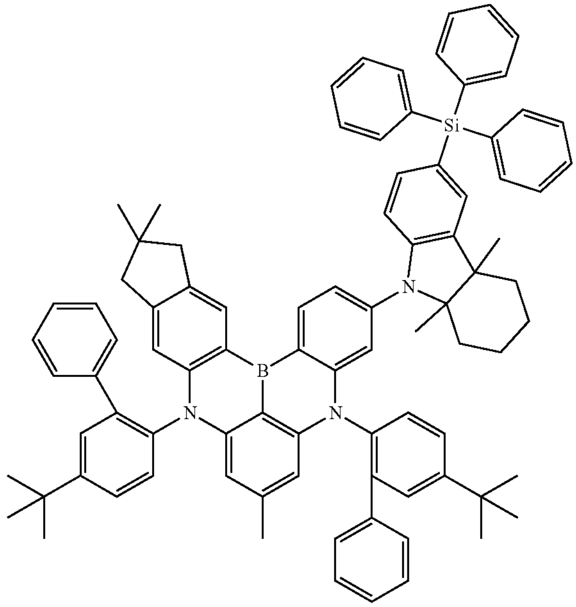
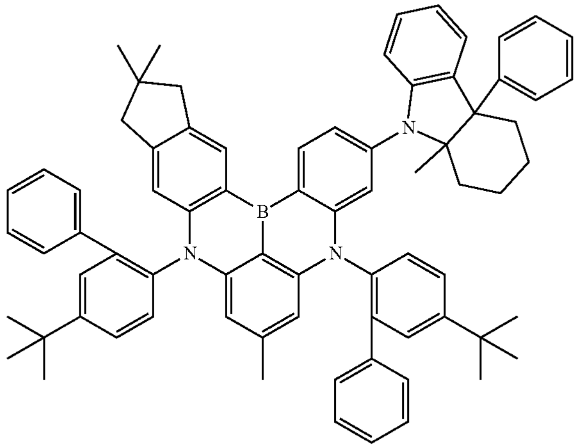
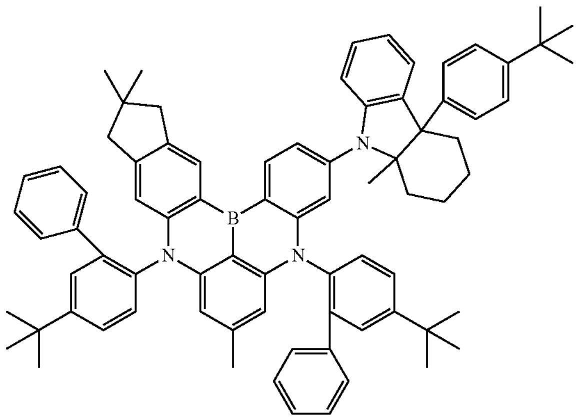
-continued
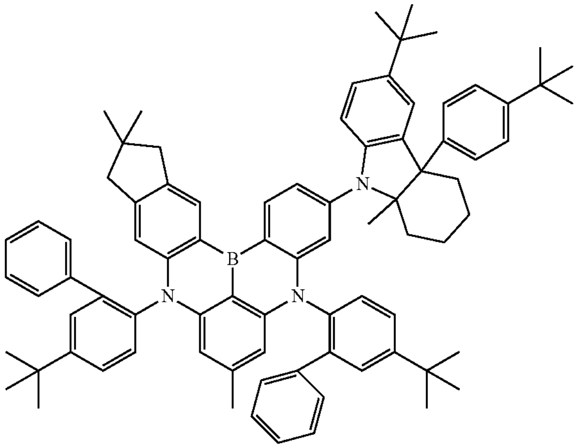
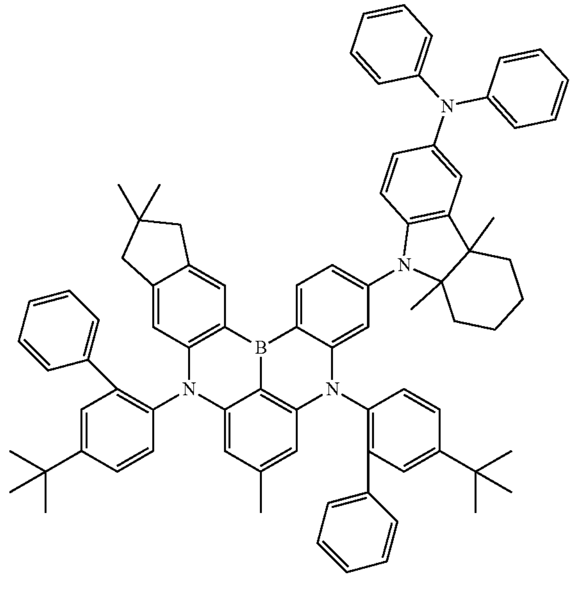
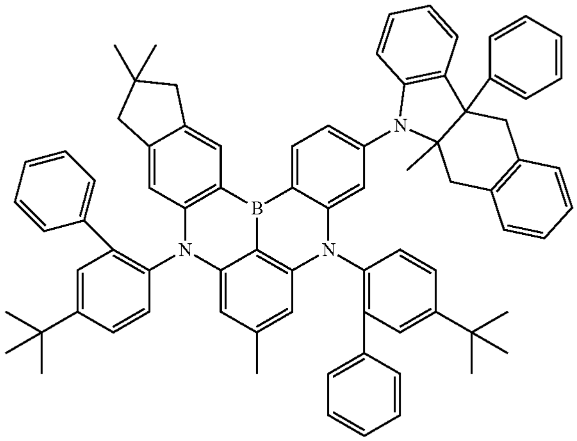

-continued
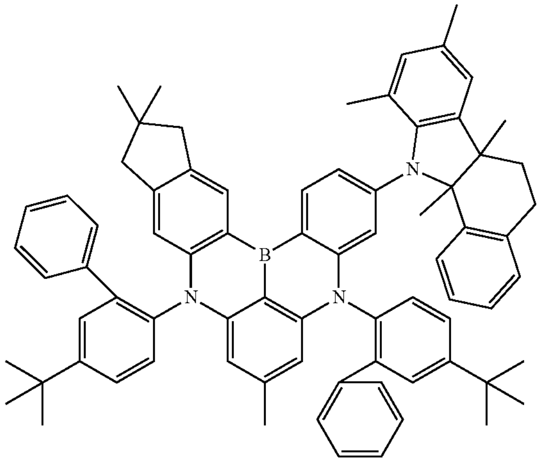
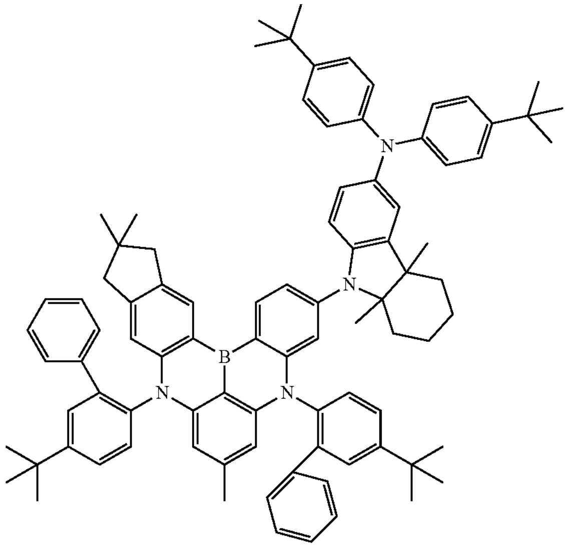
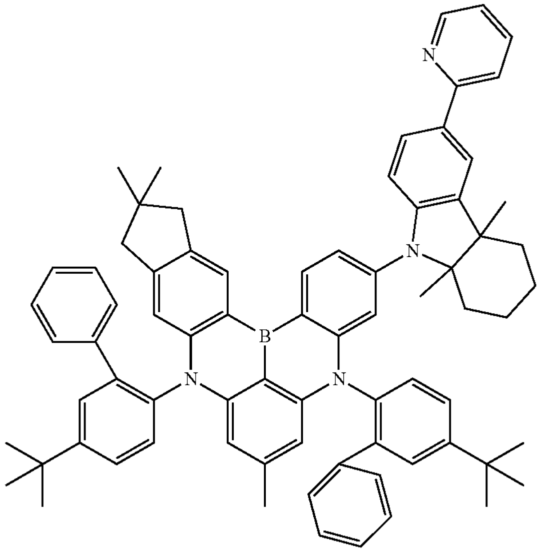
-continued
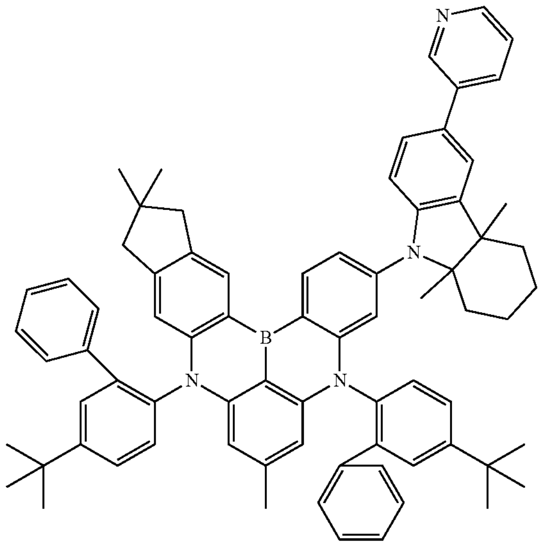
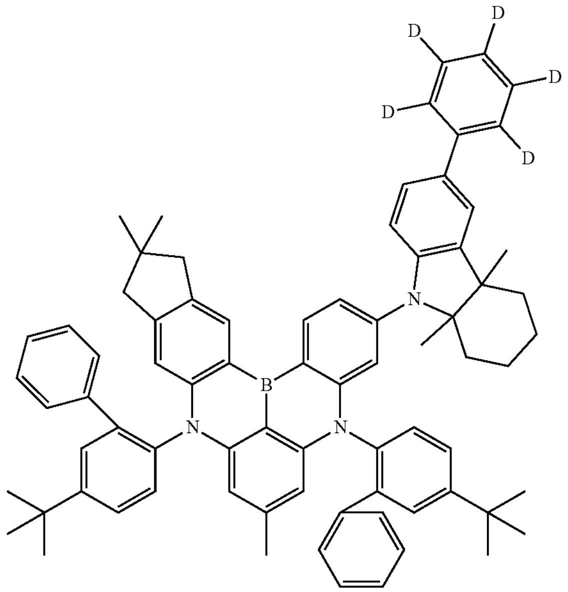
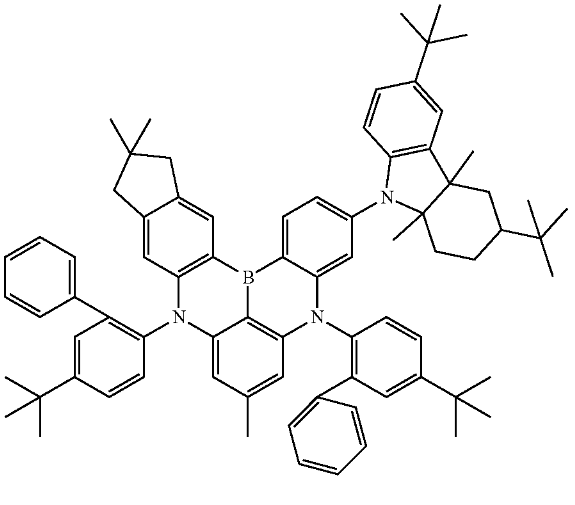

-continued
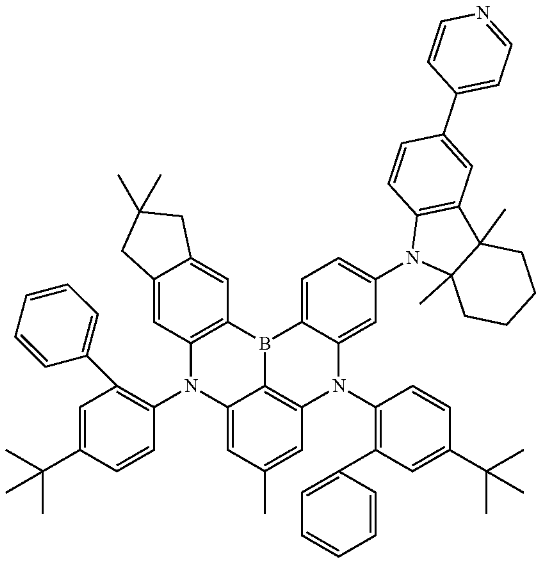
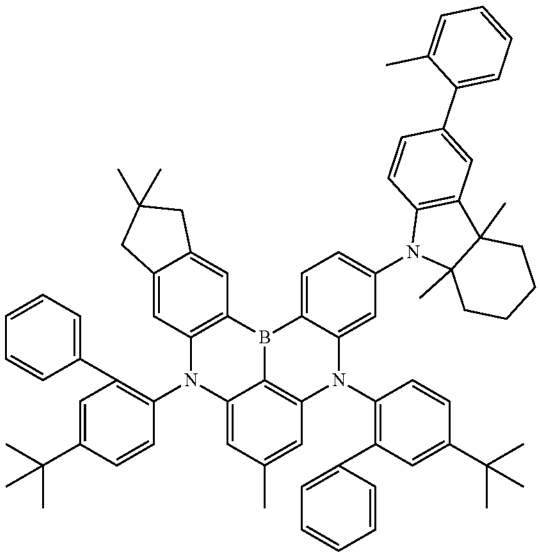
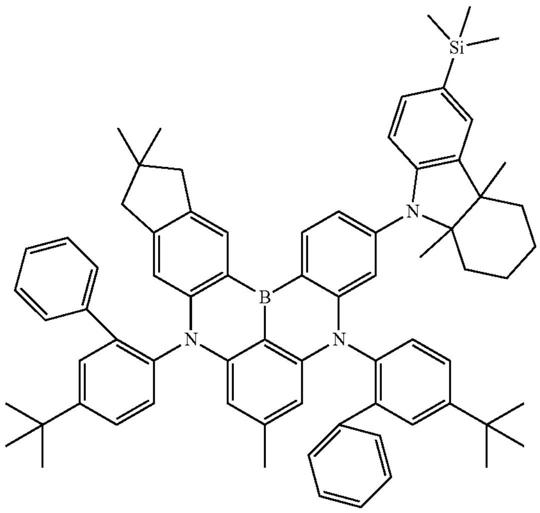
-continued
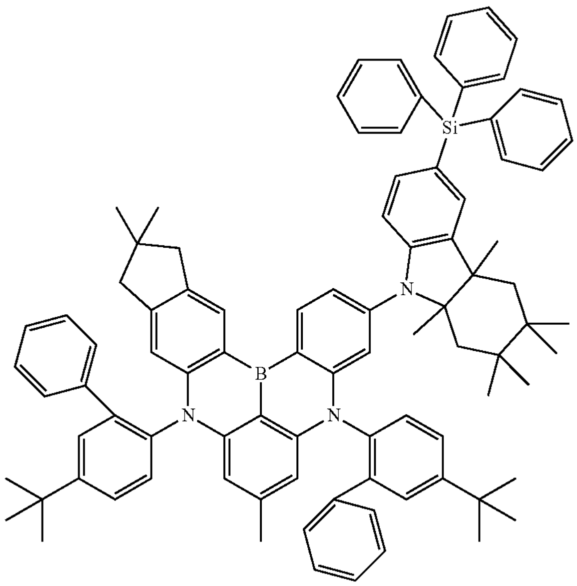
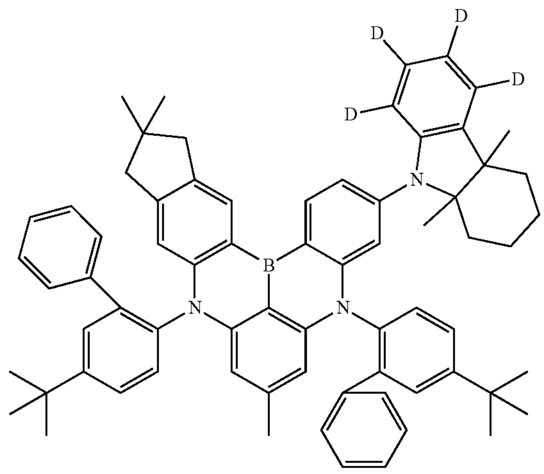
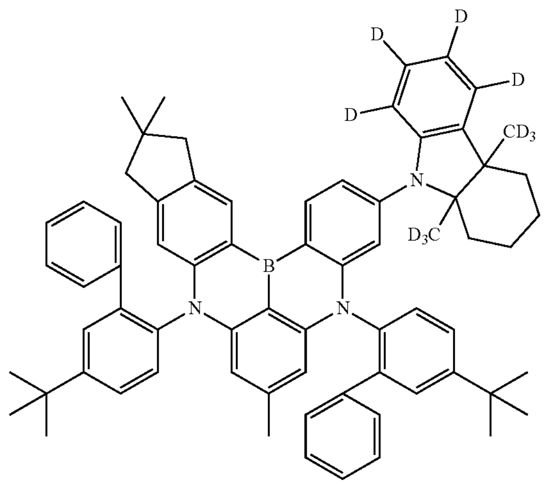

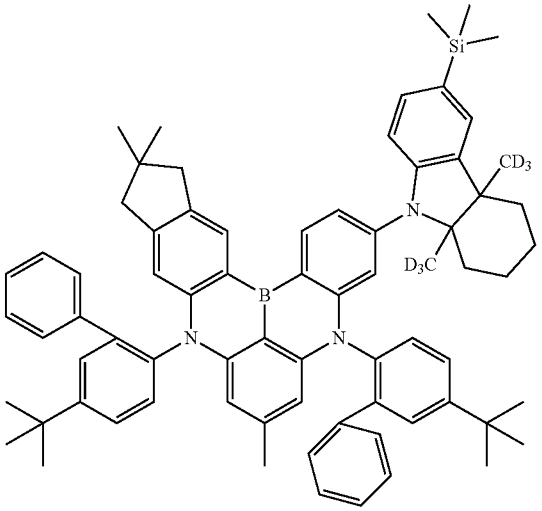
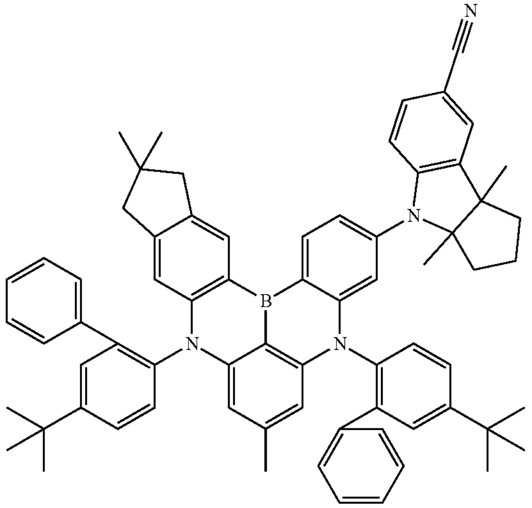
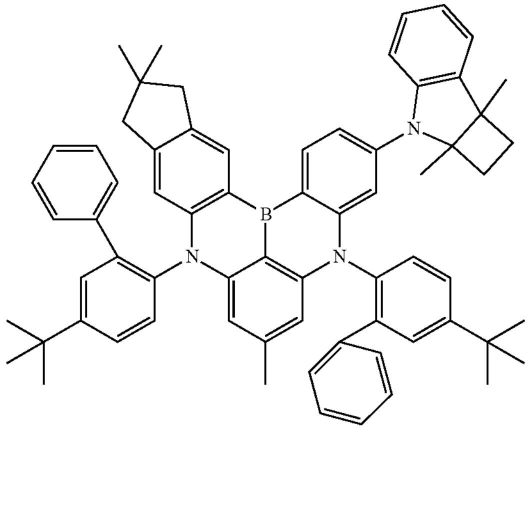
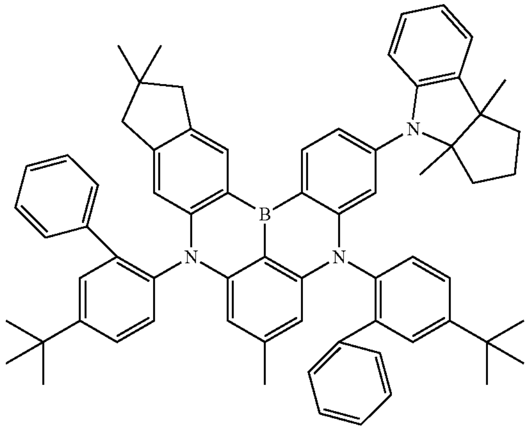
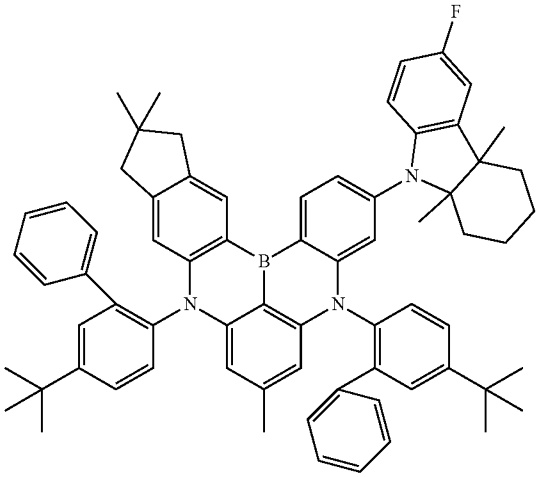
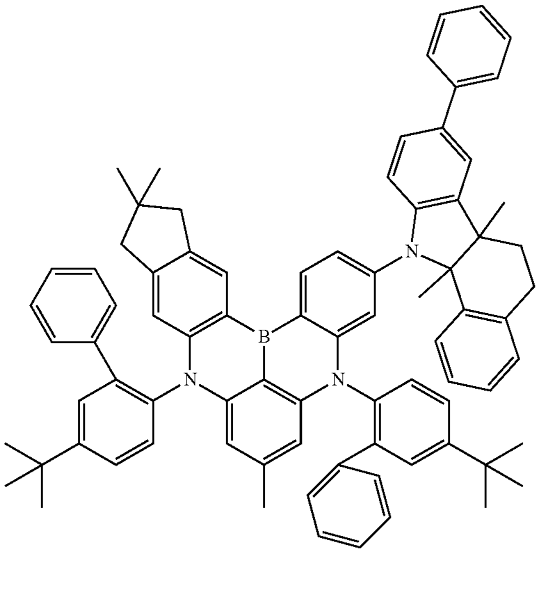

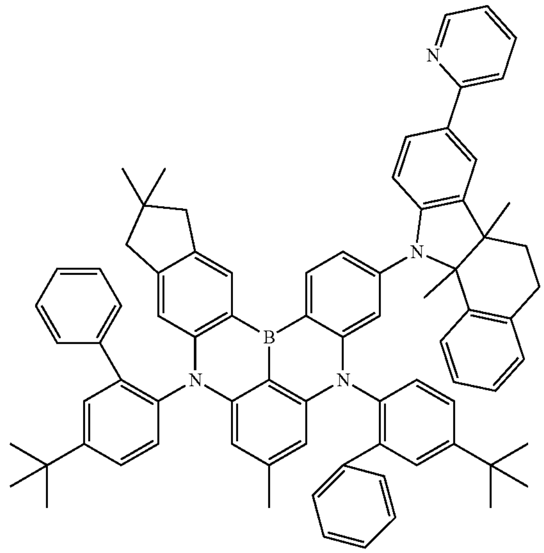
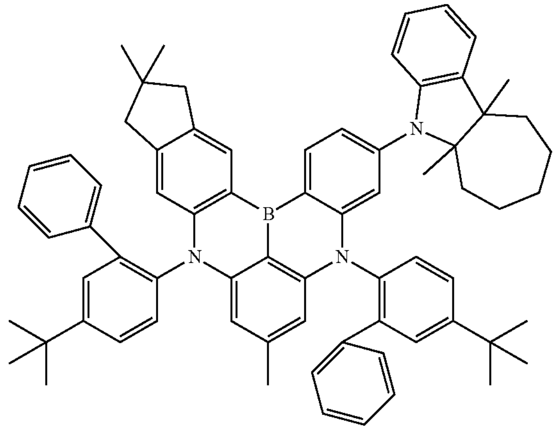
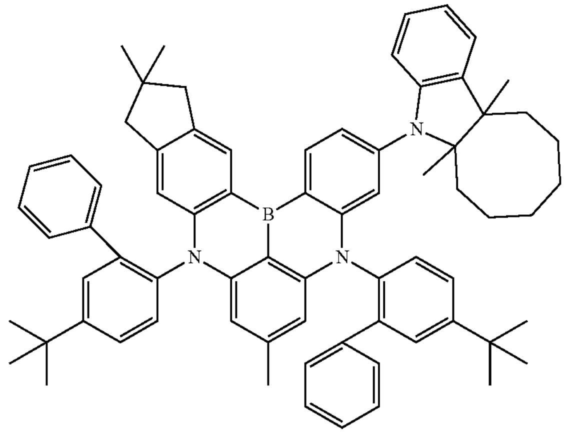
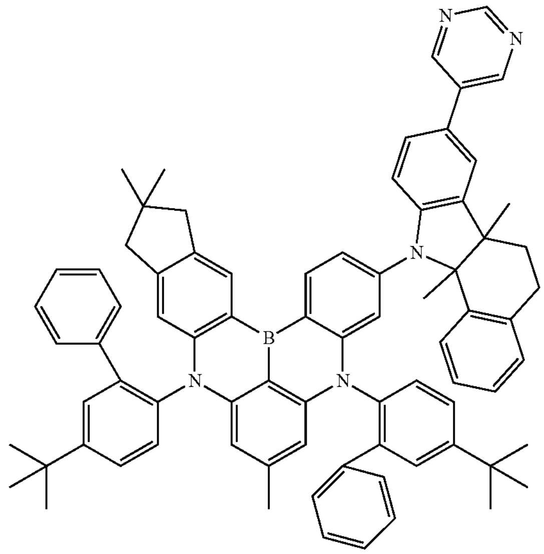
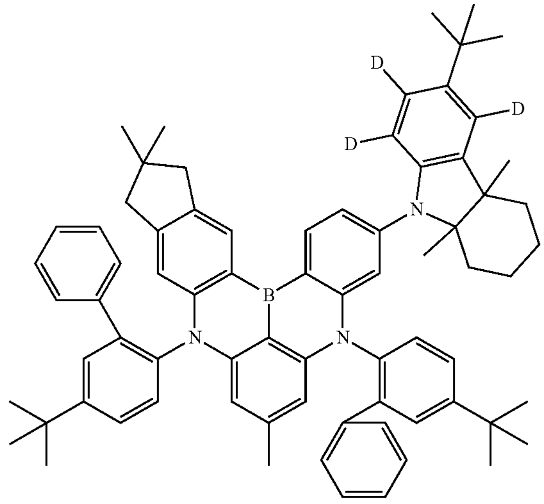
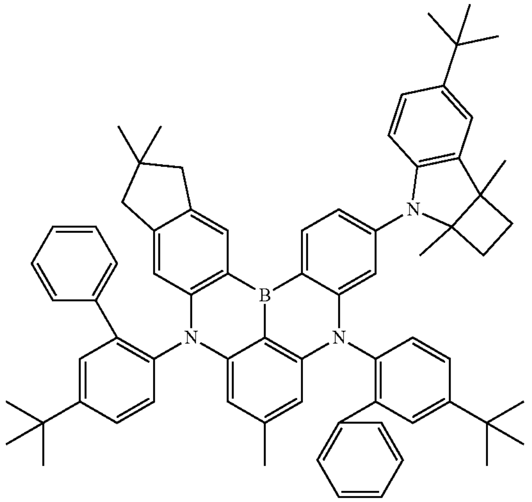

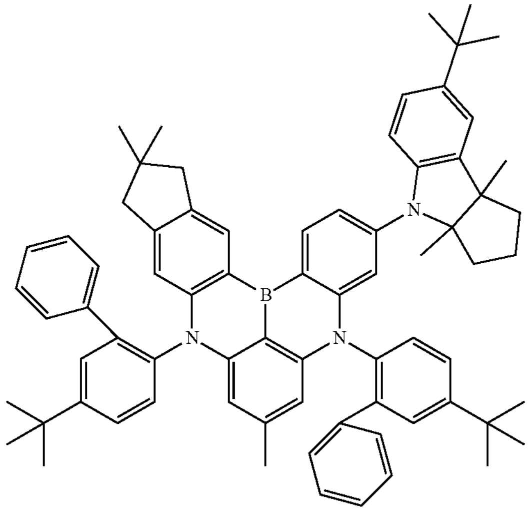
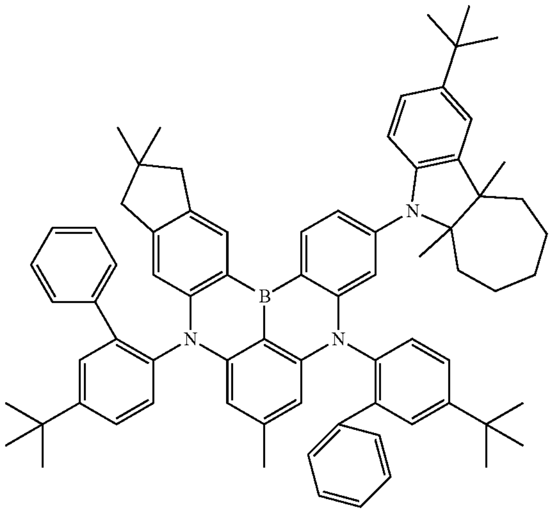
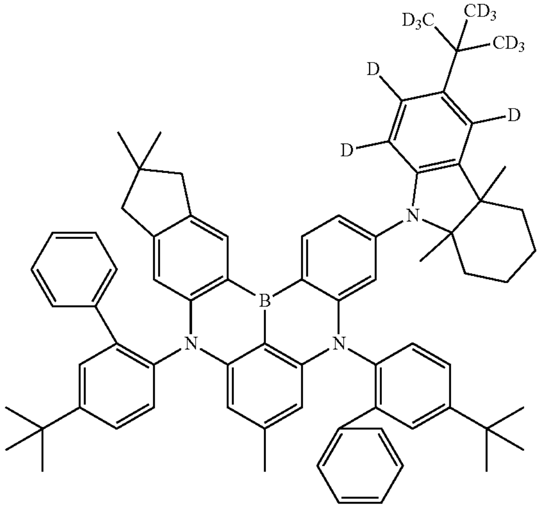
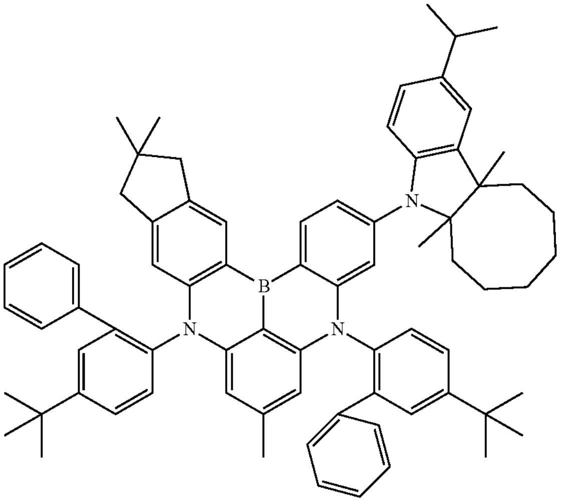
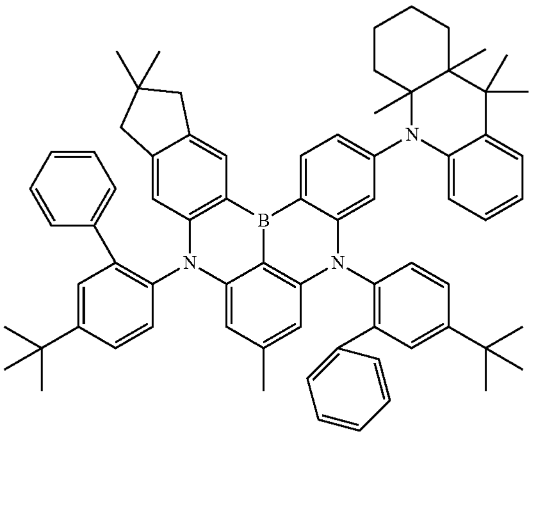
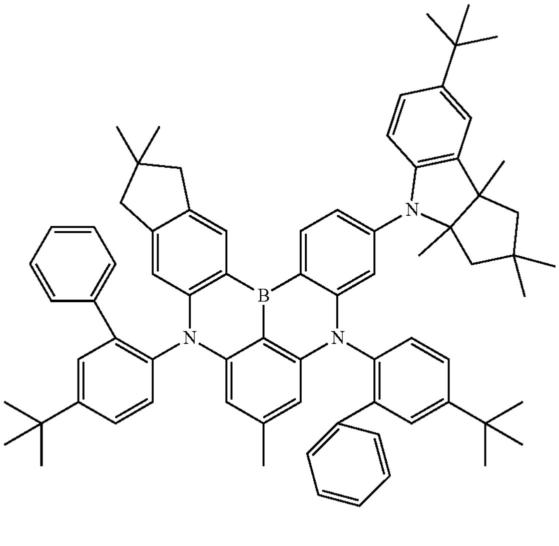

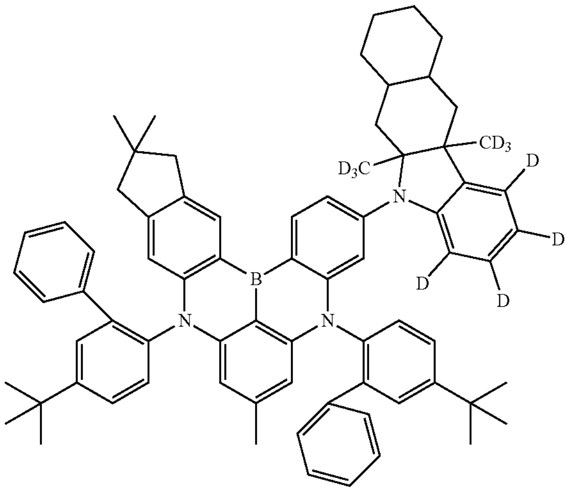
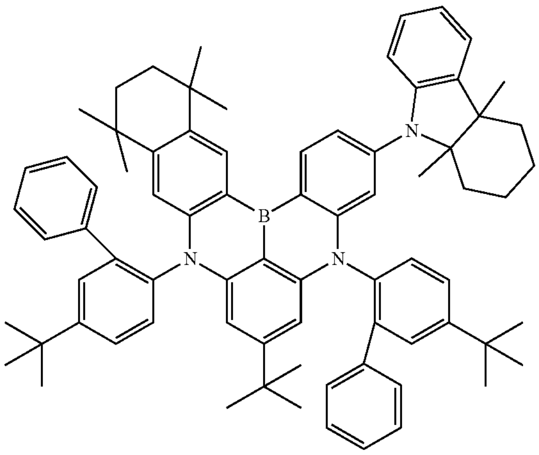
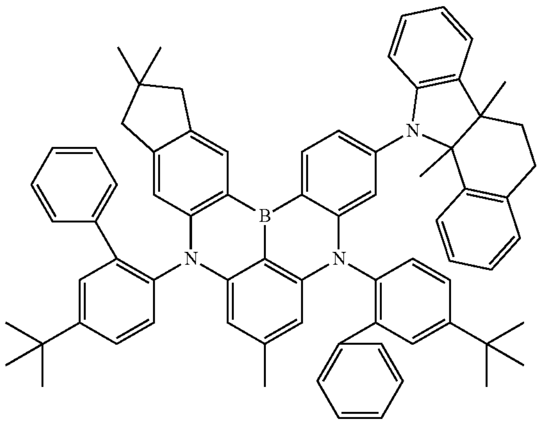
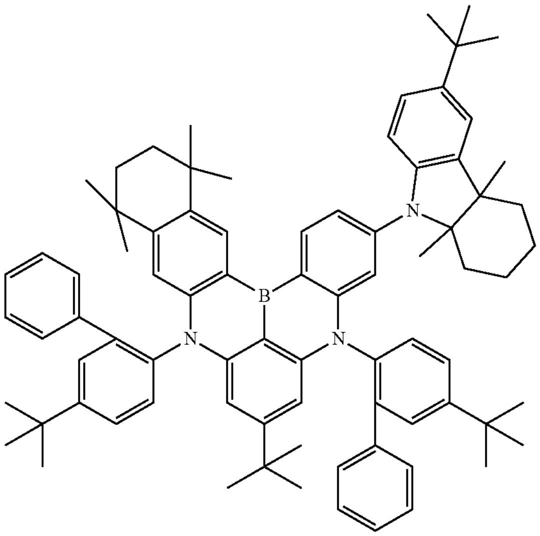
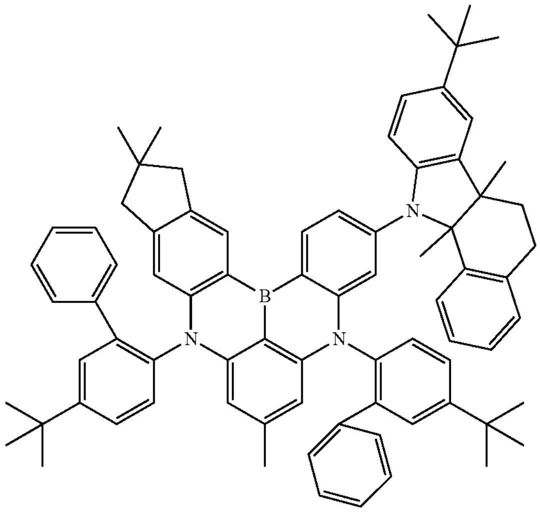
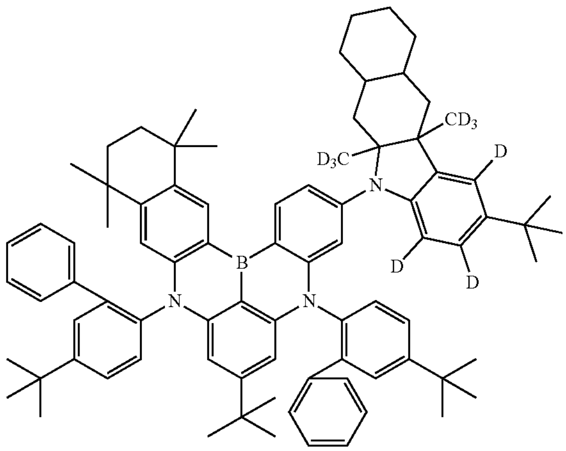

-continued
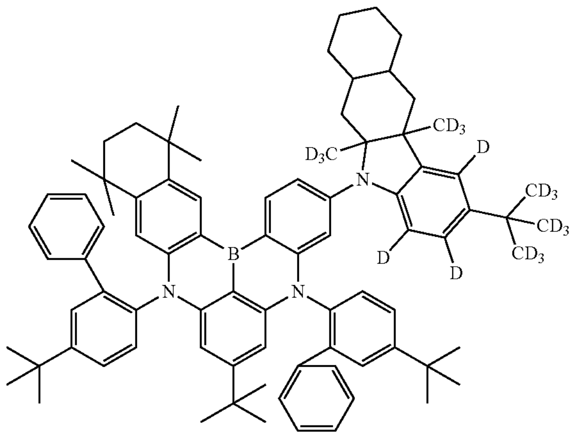
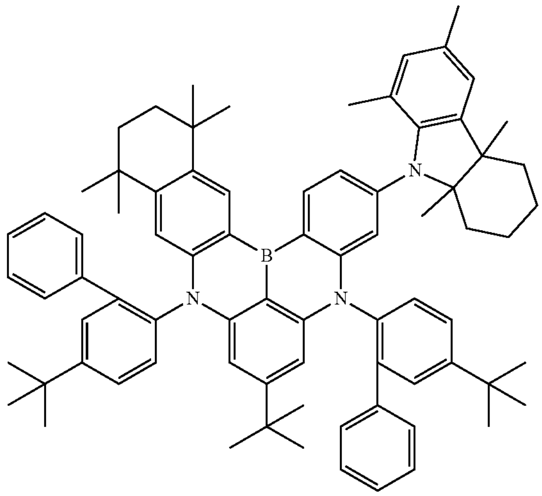
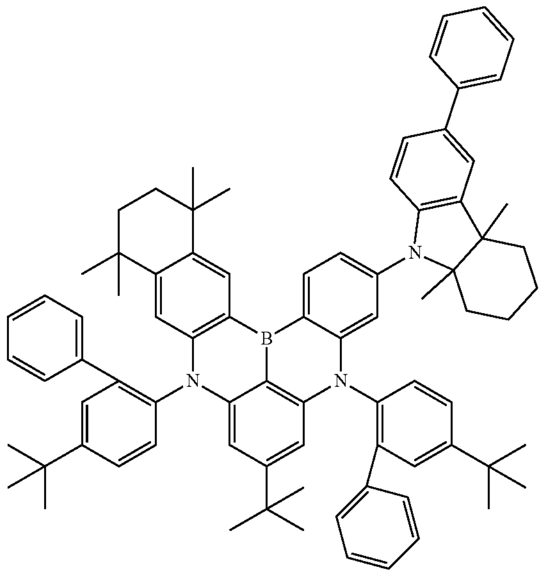
-continued
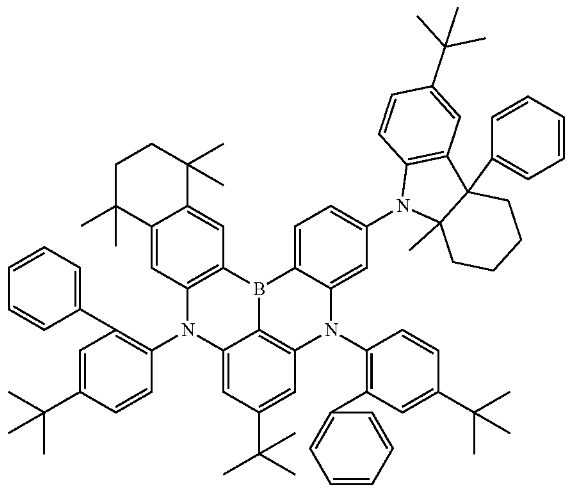
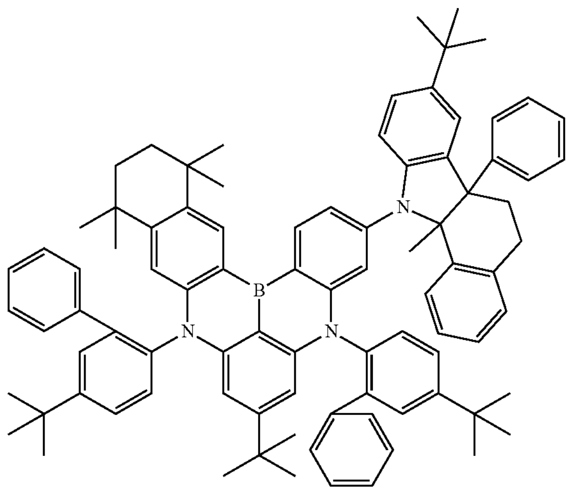
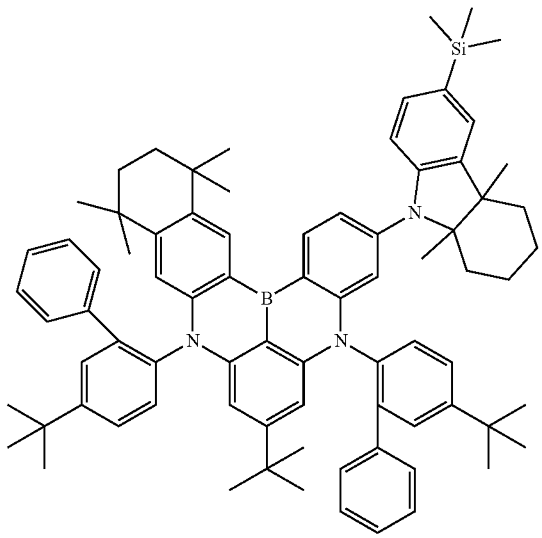

-continued
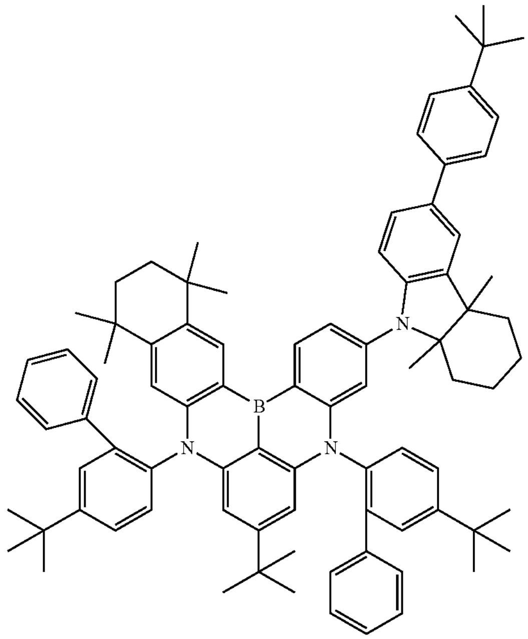
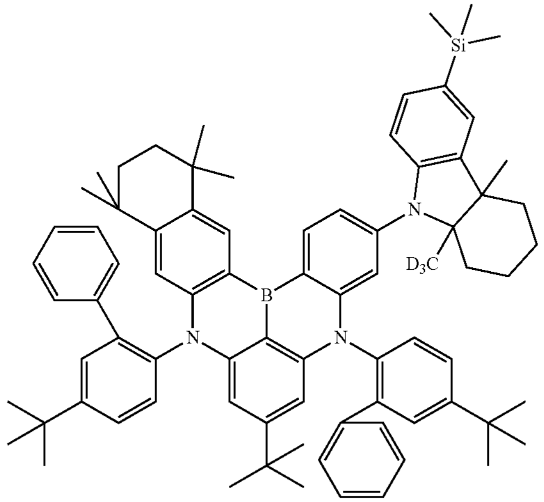
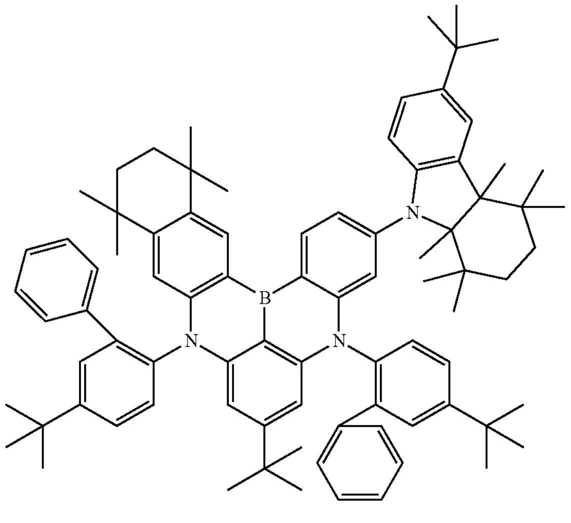
-continued
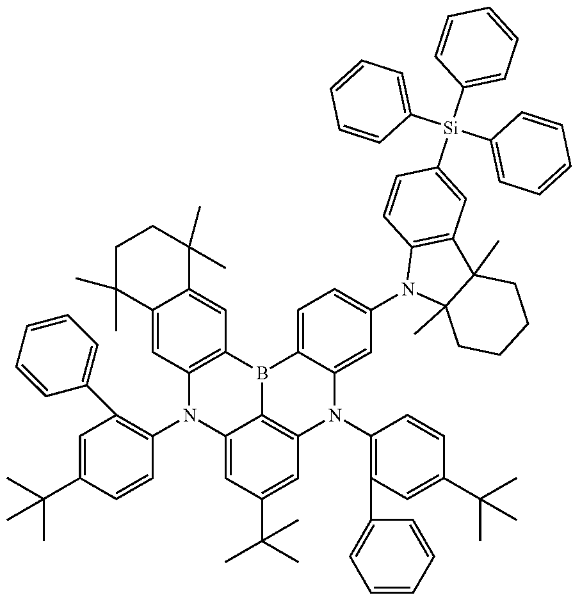
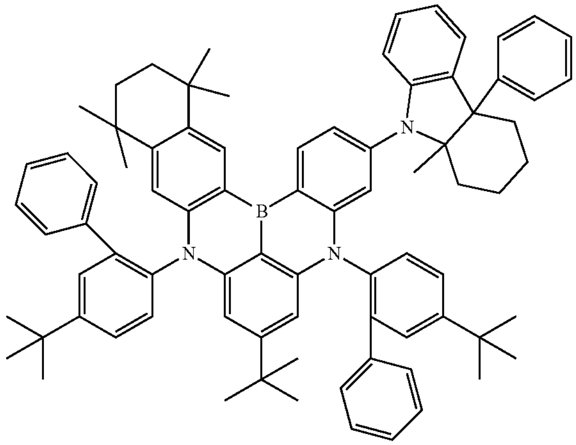
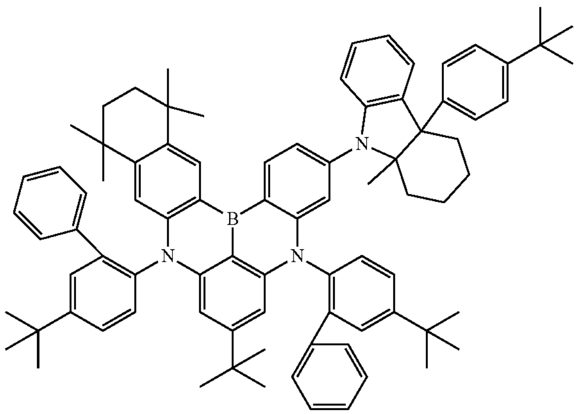

-continued
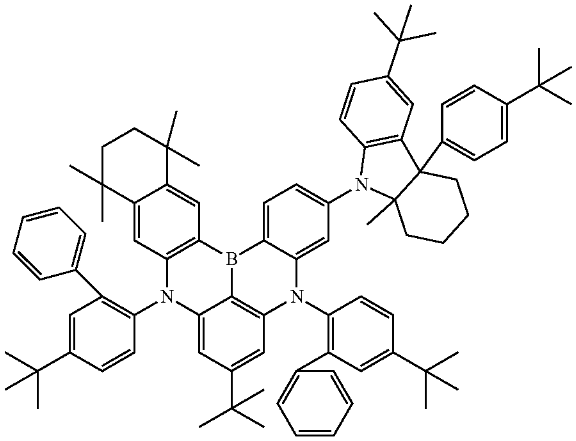
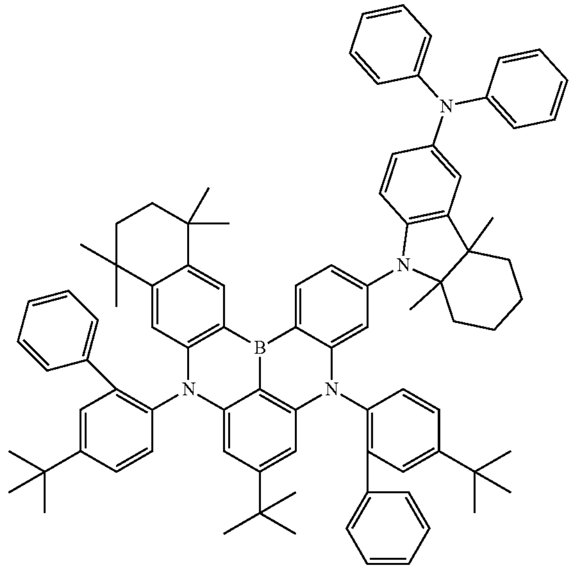
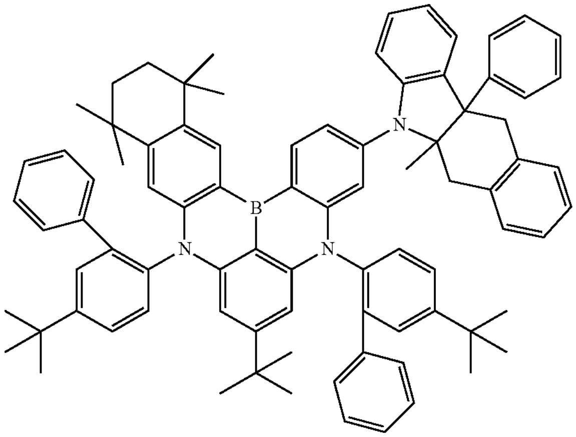
-continued
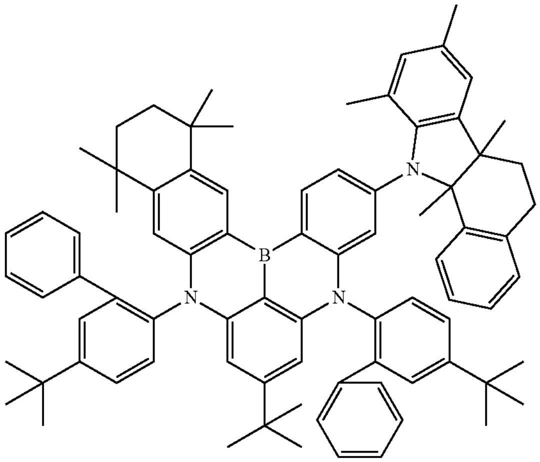
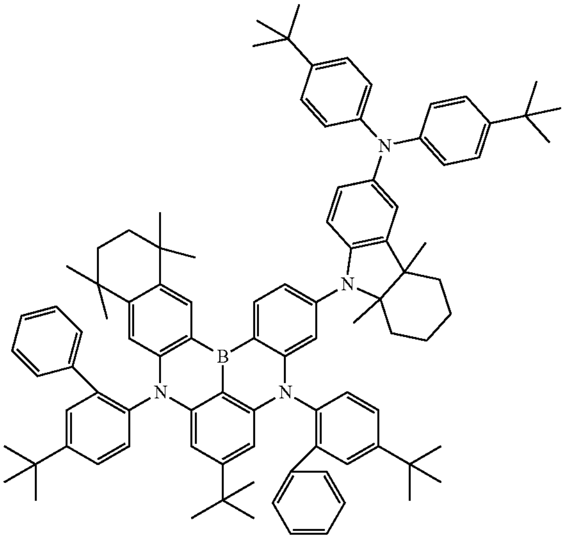
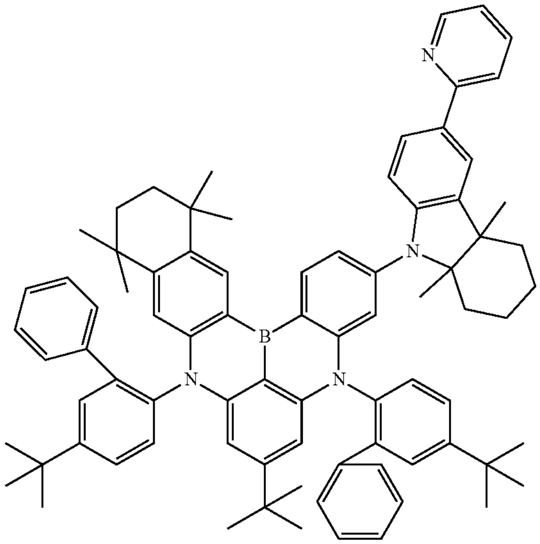

-continued
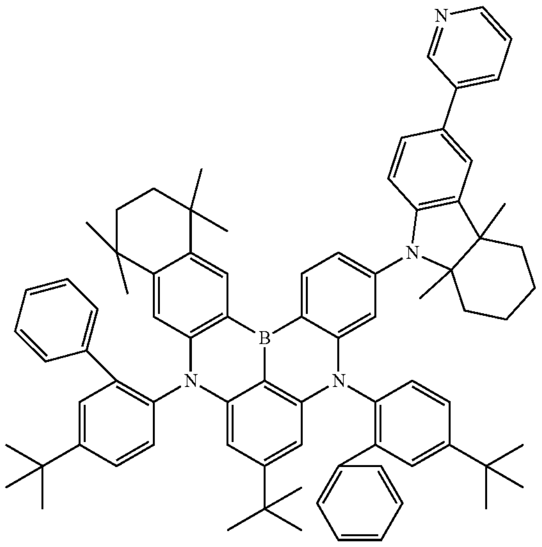
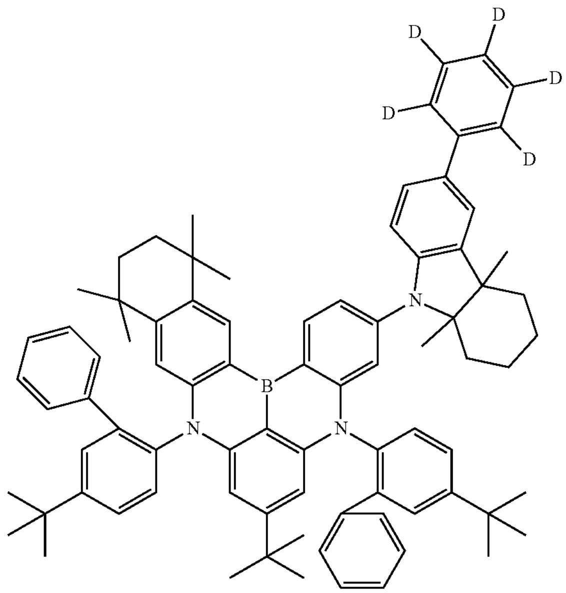
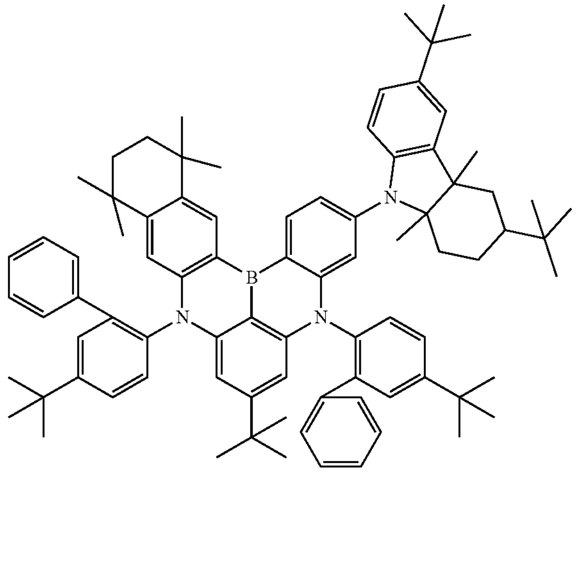
-continued
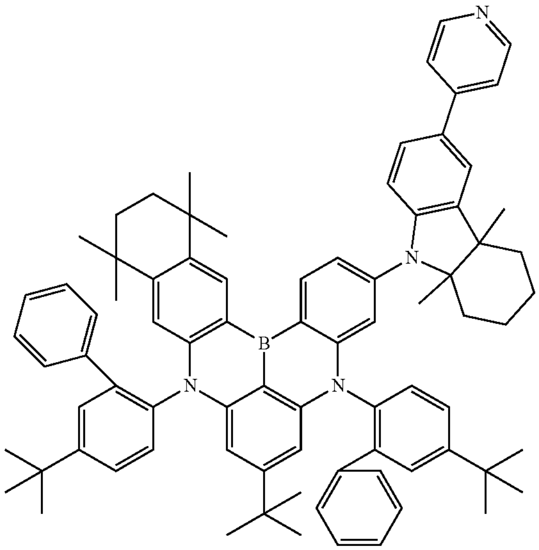
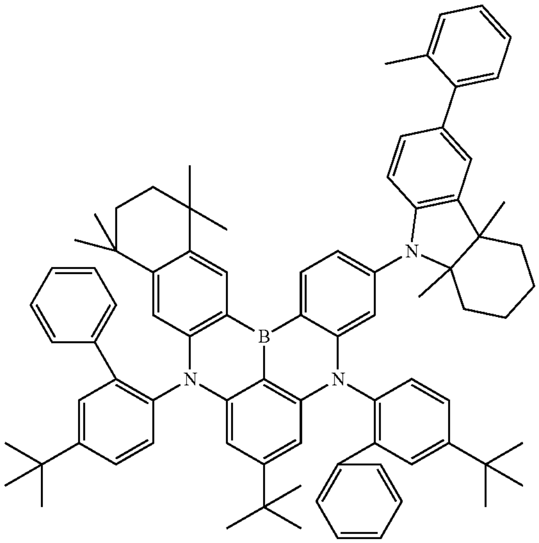
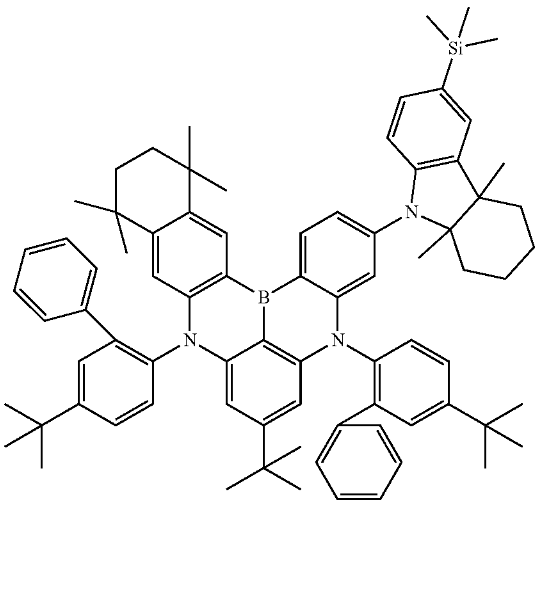

-continued
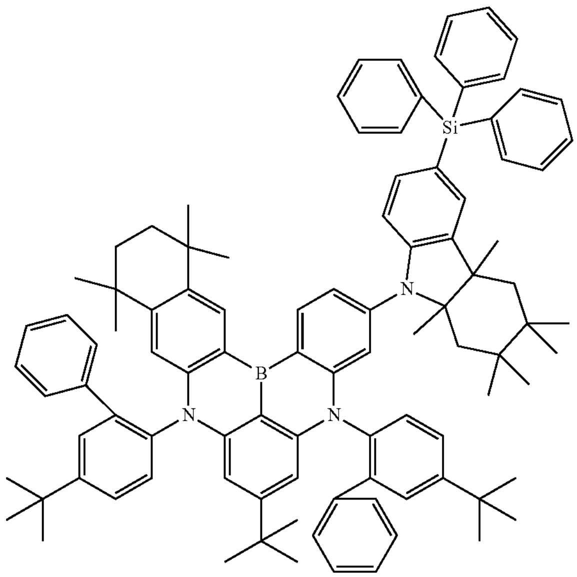
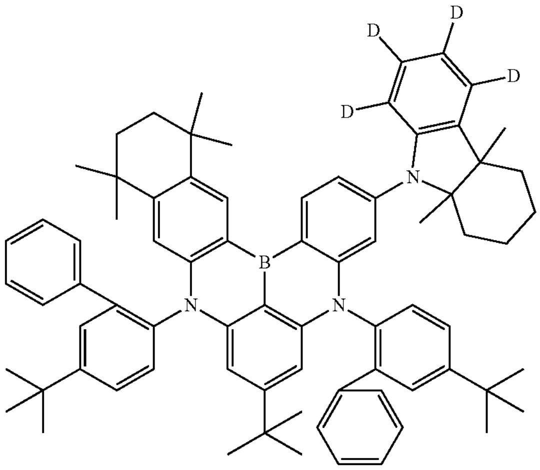
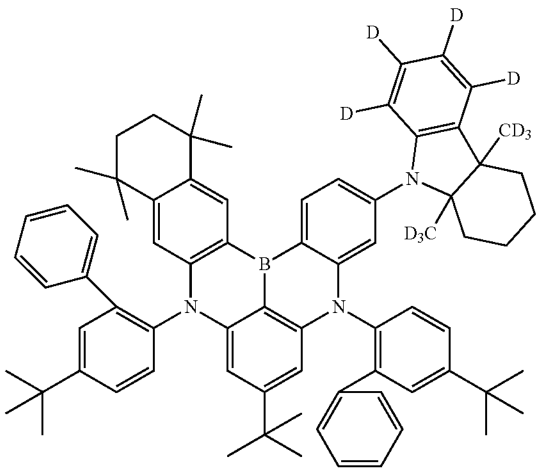
-continued
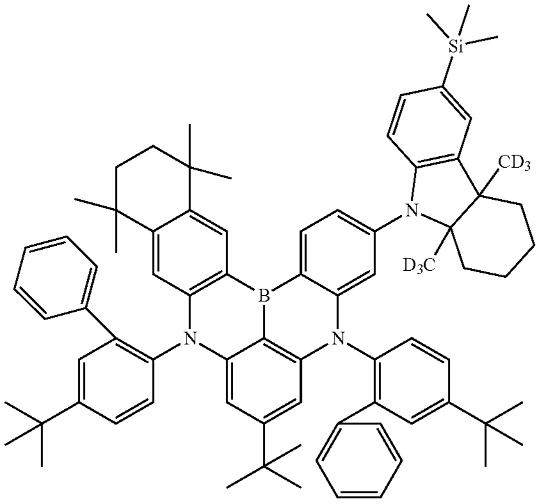
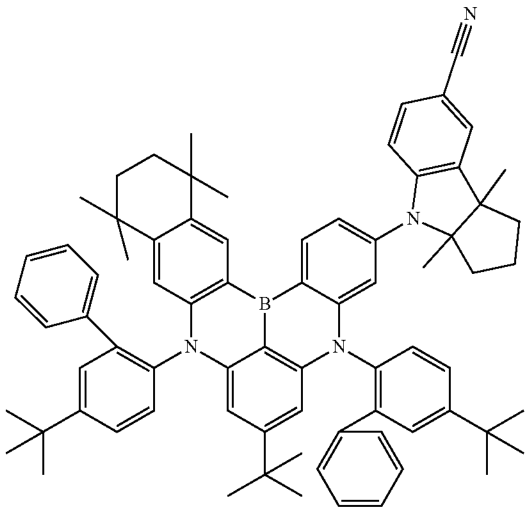
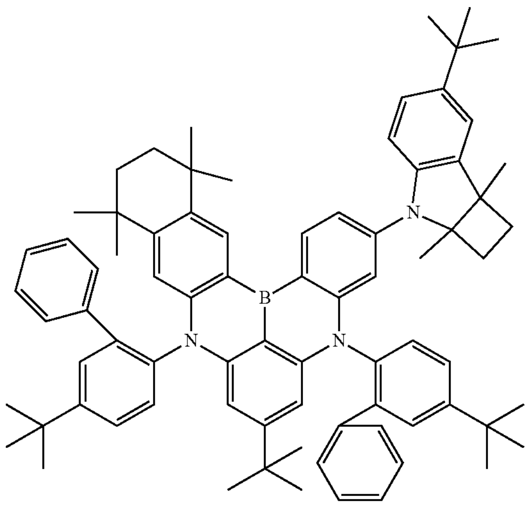

-continued
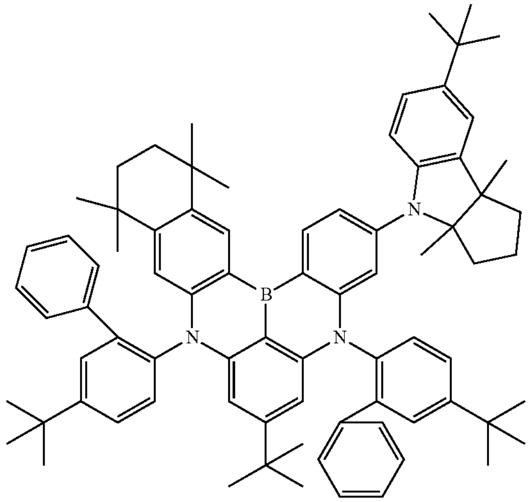
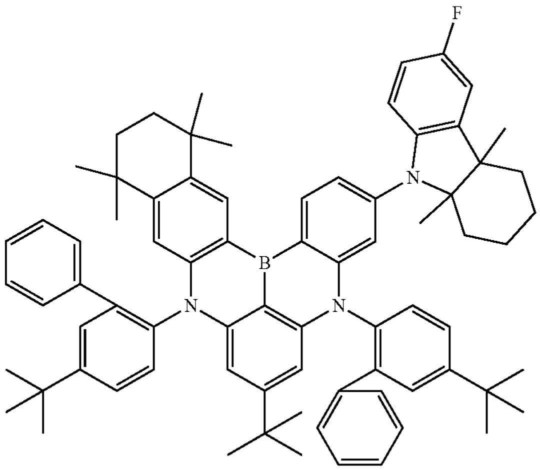
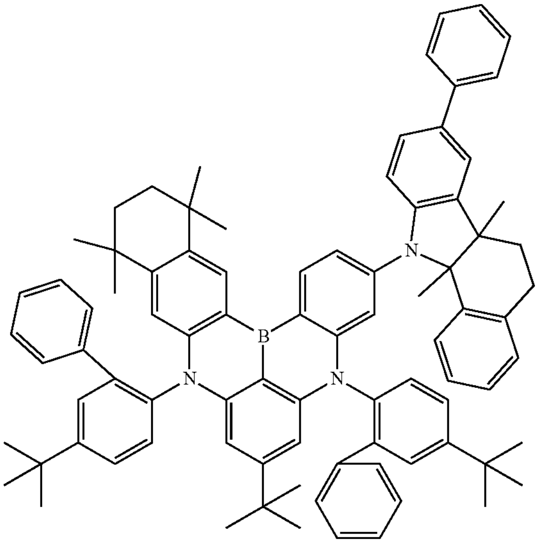
-continued
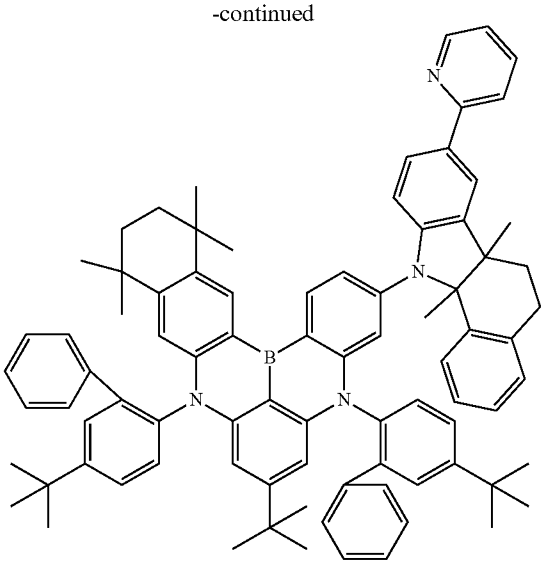
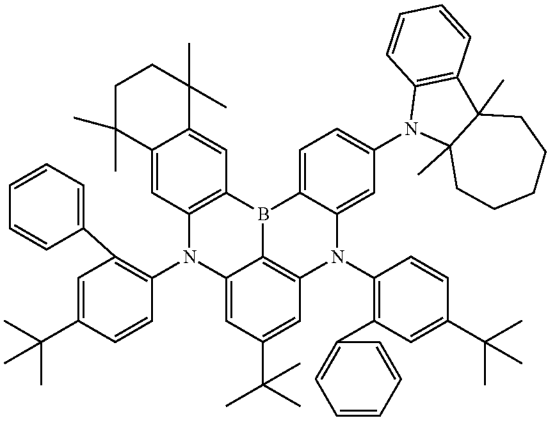
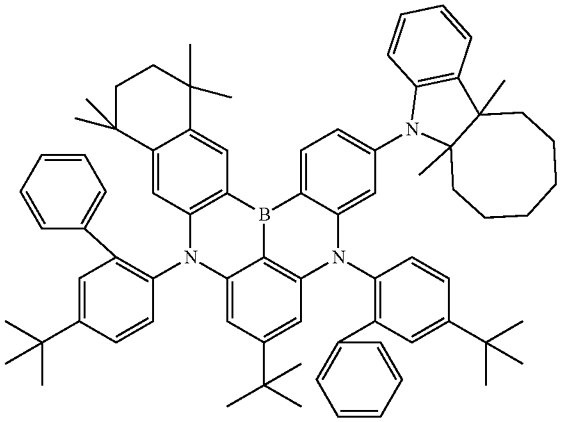

-continued
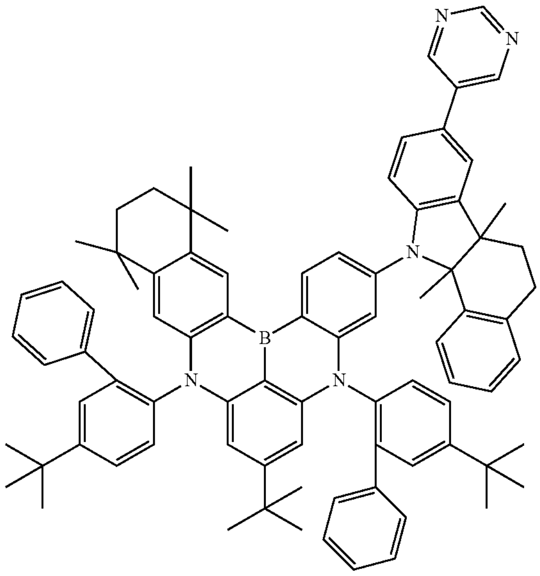
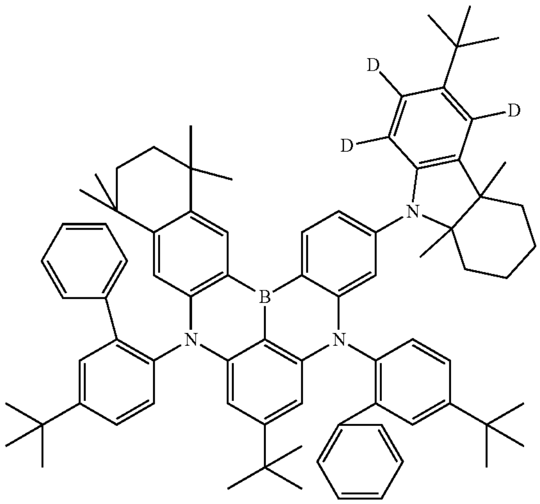
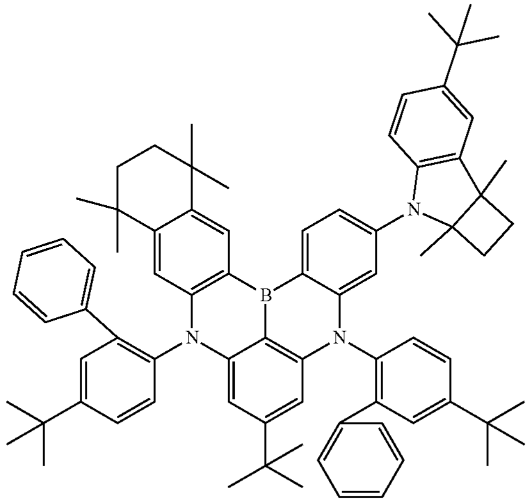
-continued
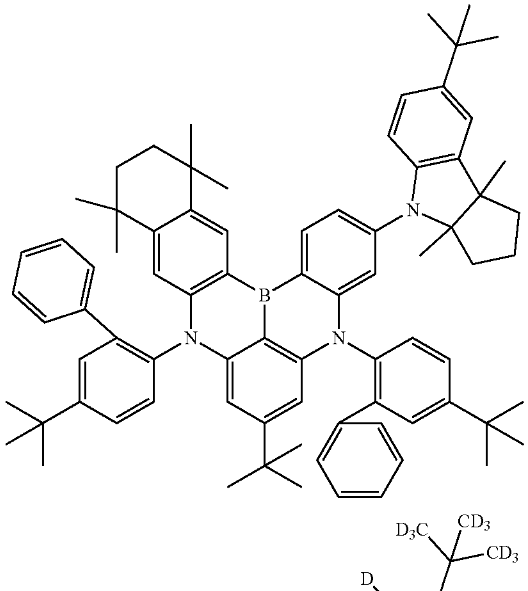
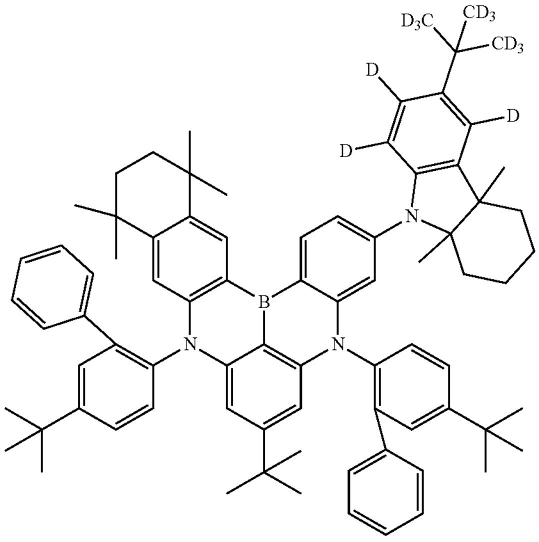
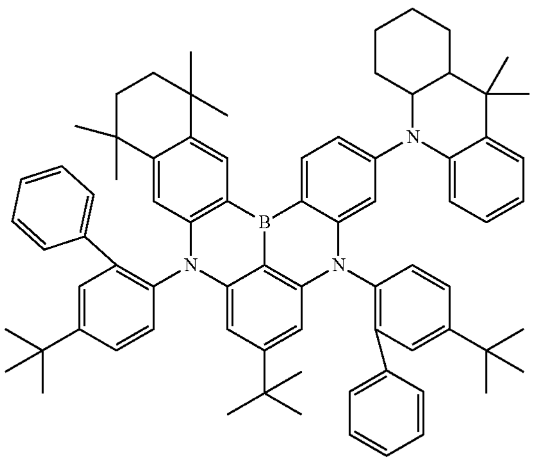

-continued
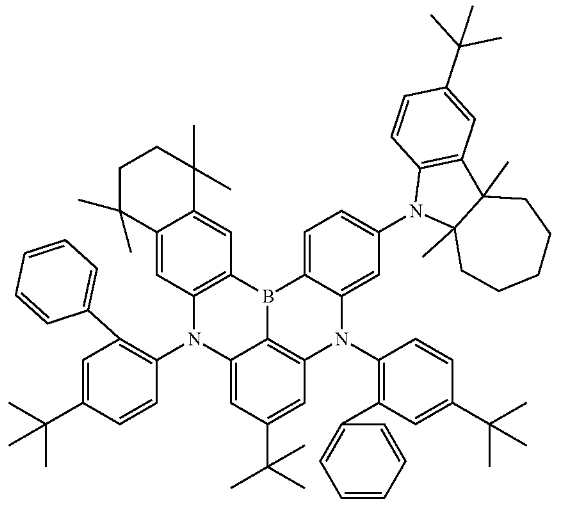
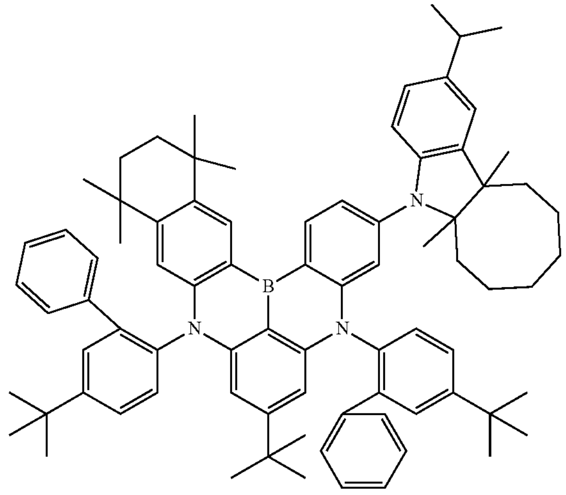
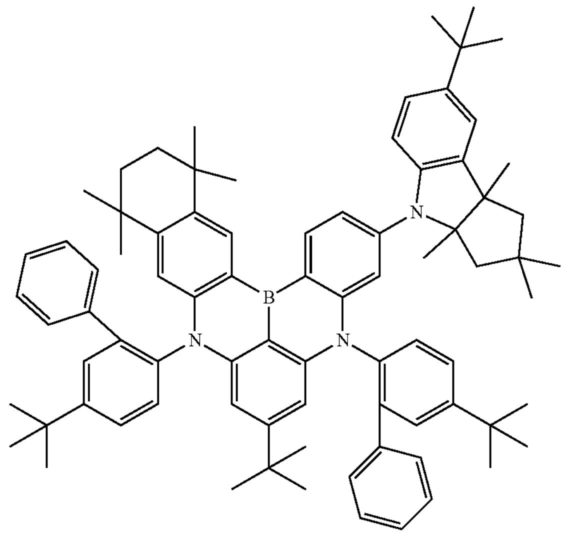
-continued
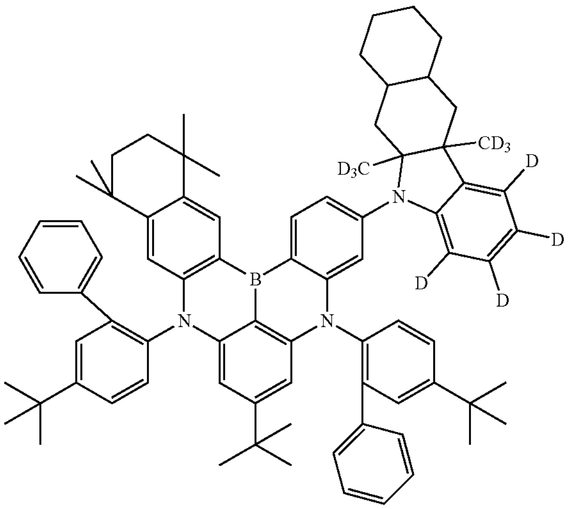
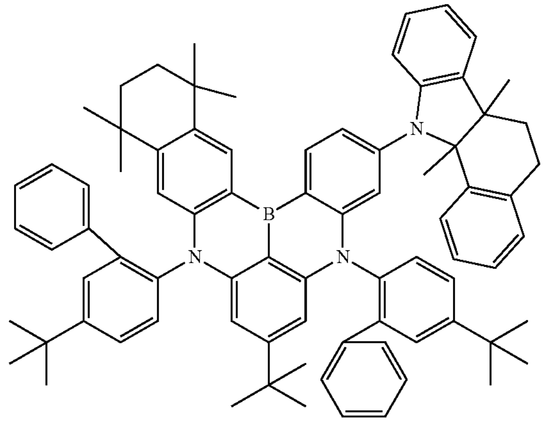
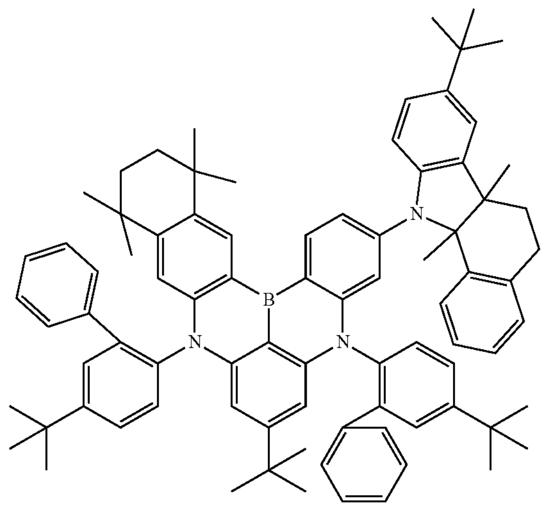

-continued
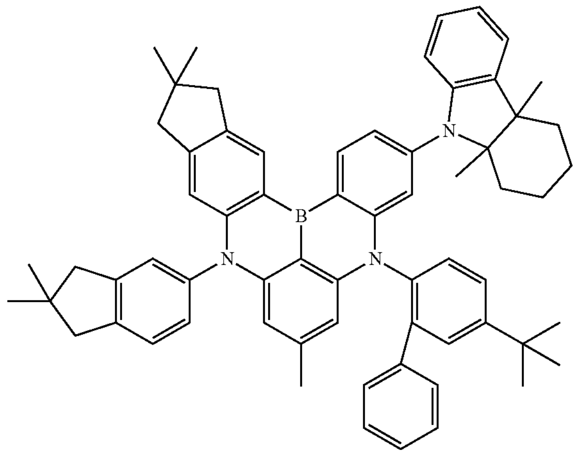
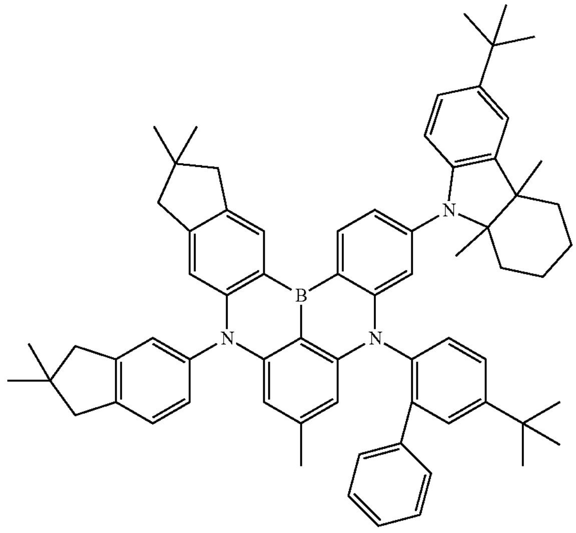
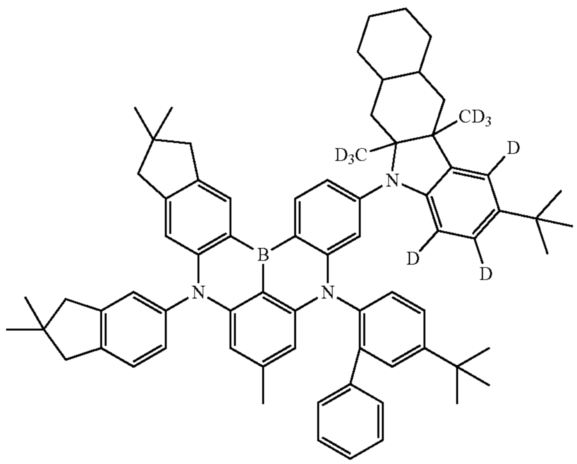
-continued
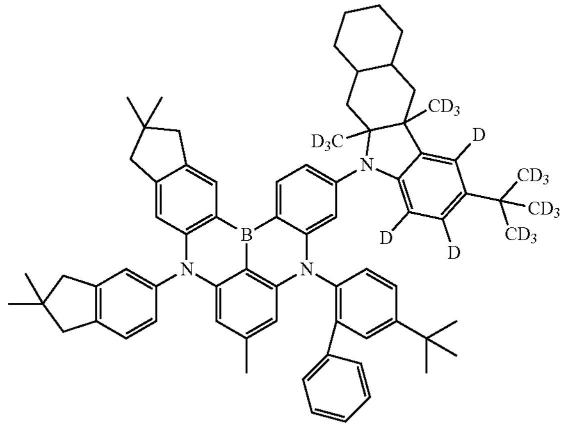
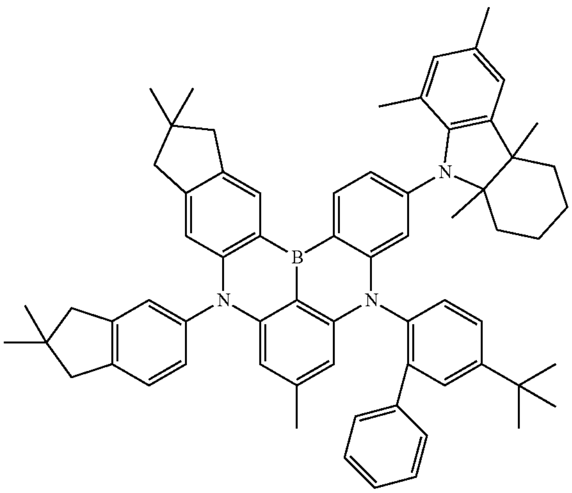
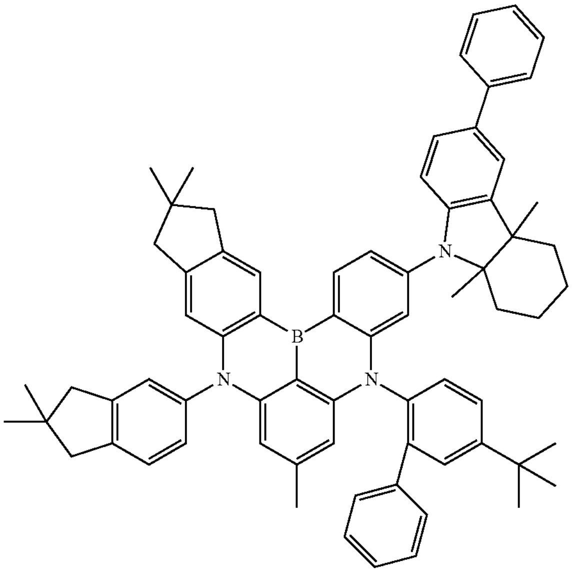

-continued
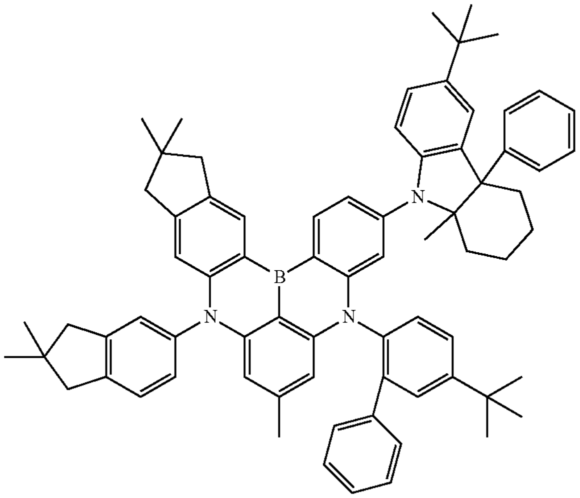
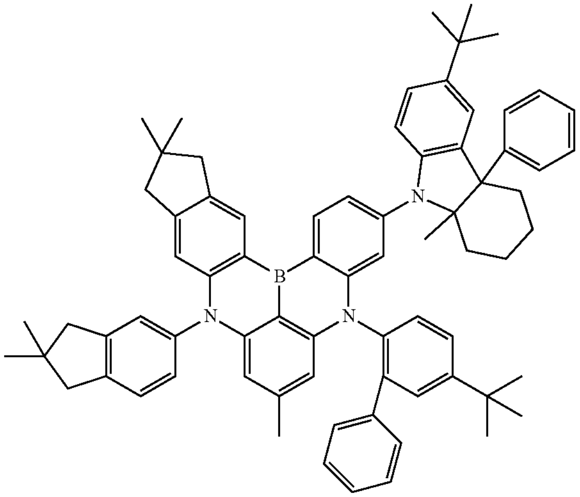
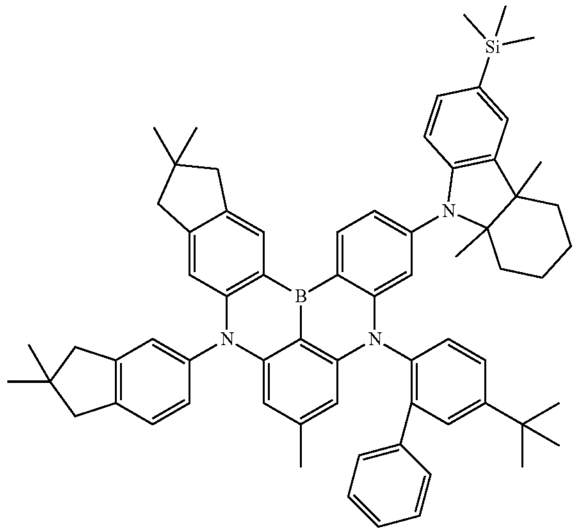
-continued
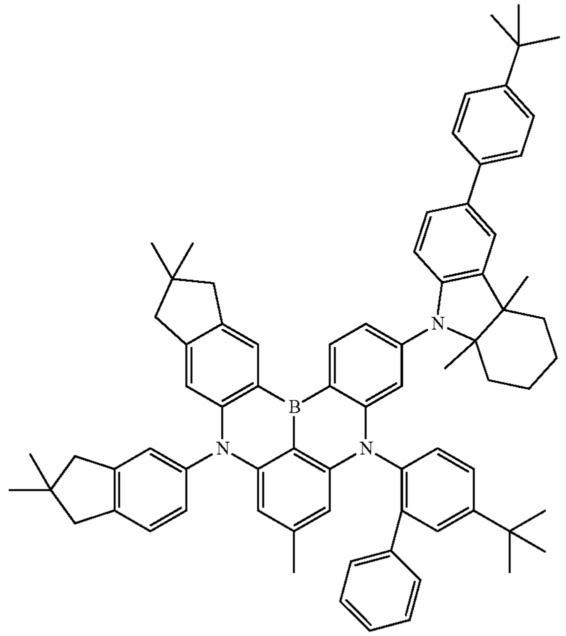
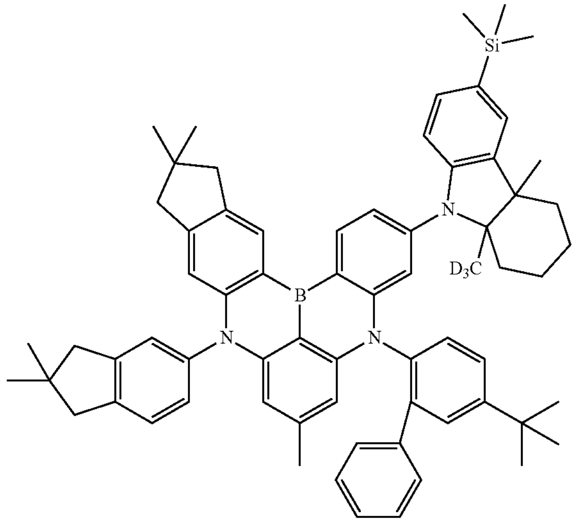
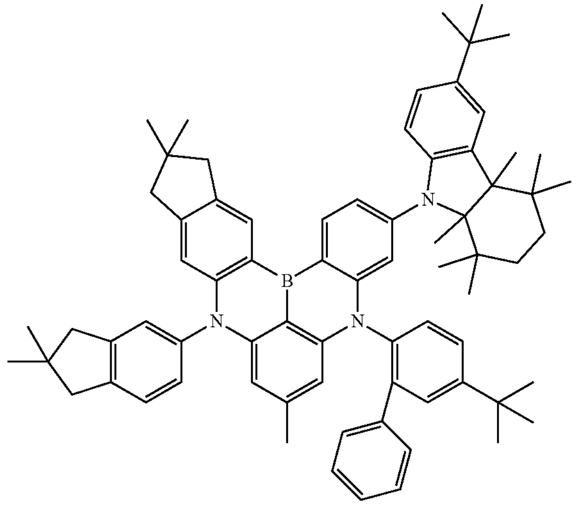

-continued
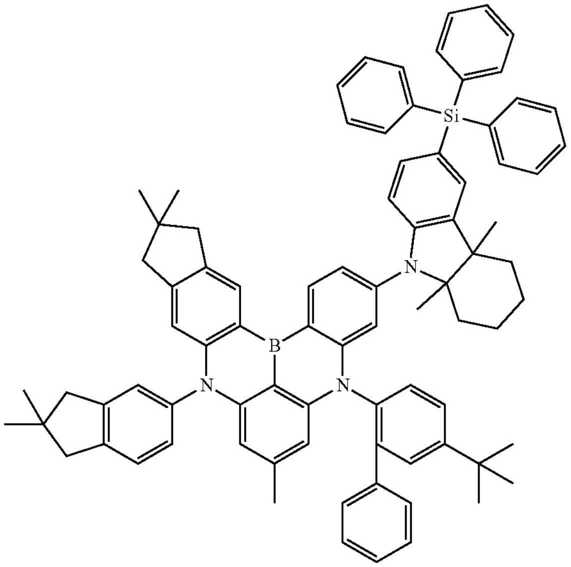
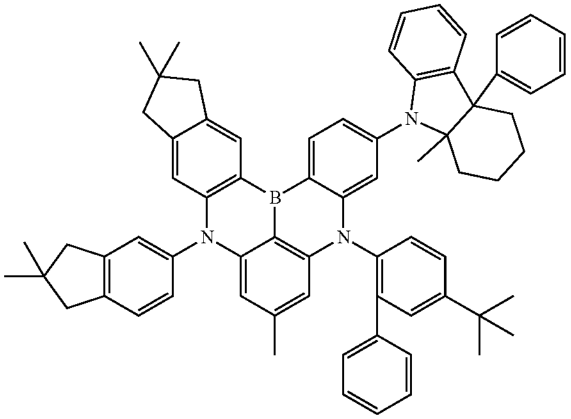
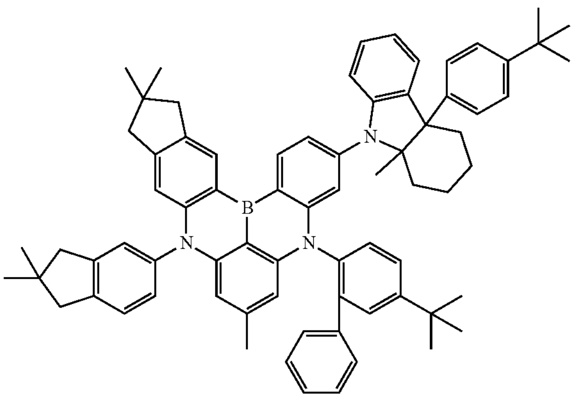
-continued
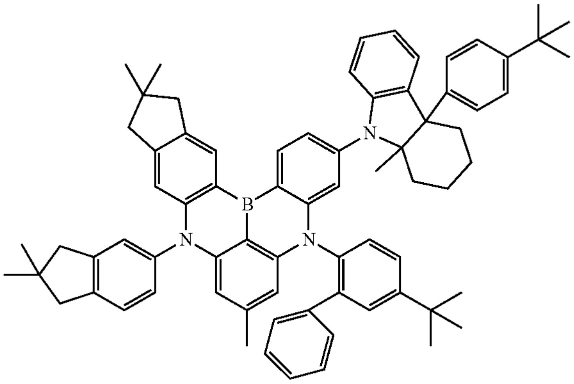
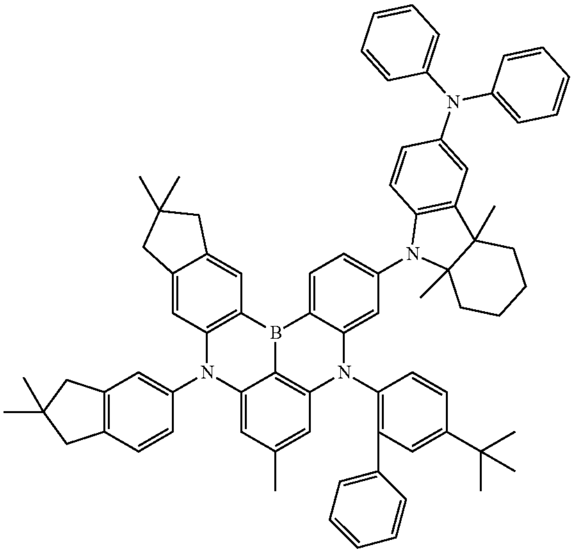
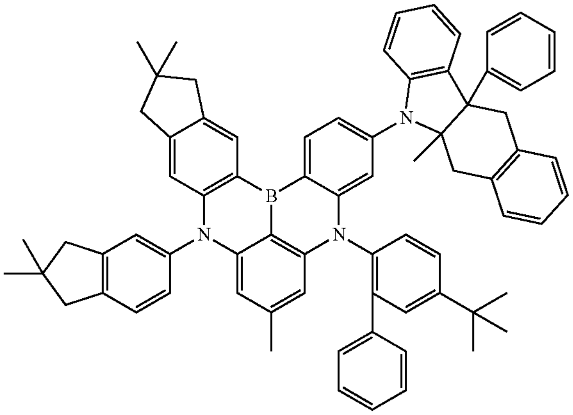

-continued
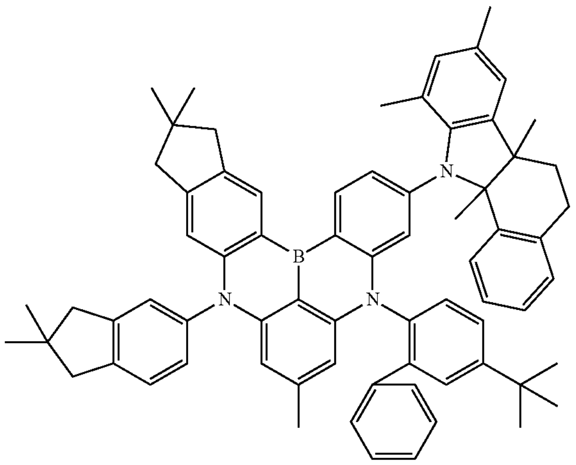
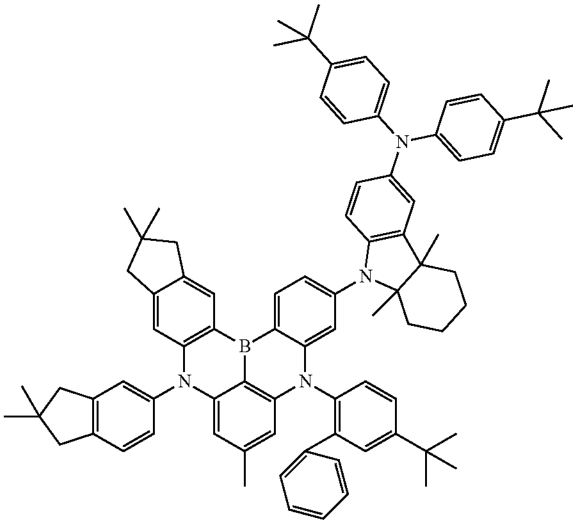
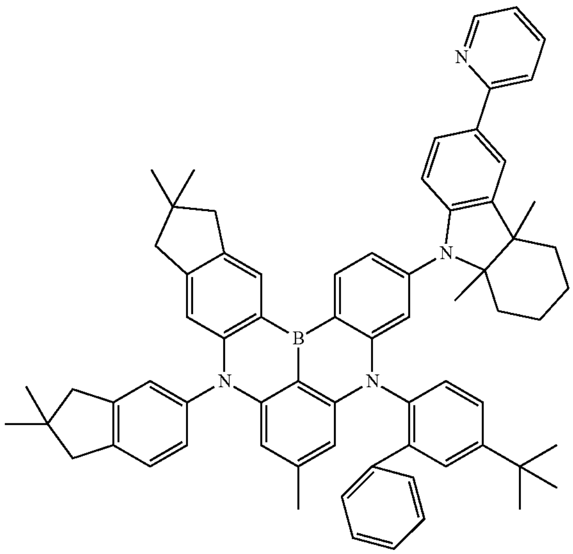
-continued
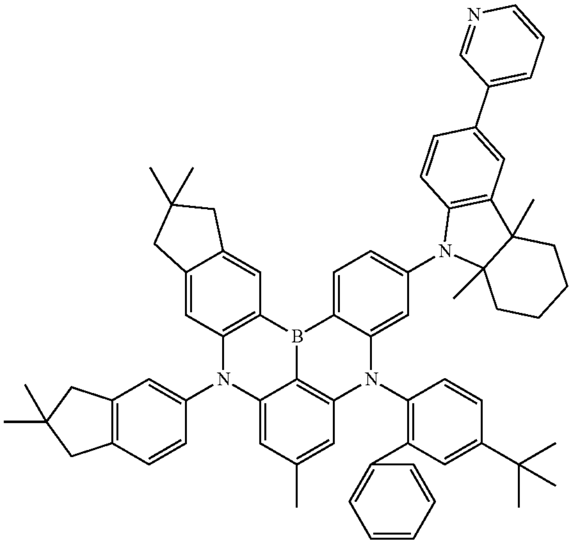
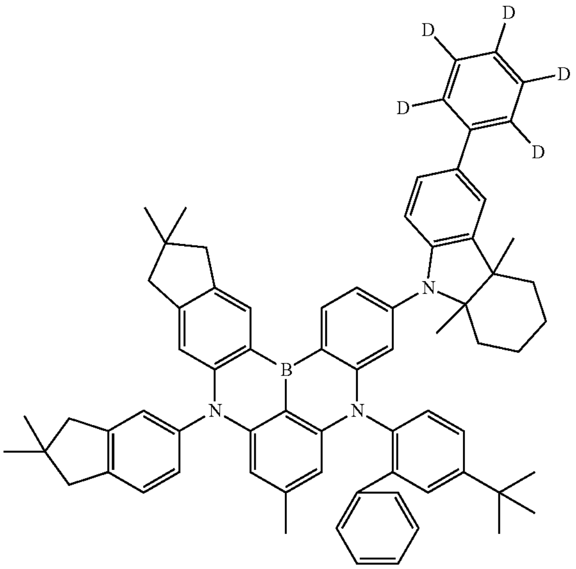
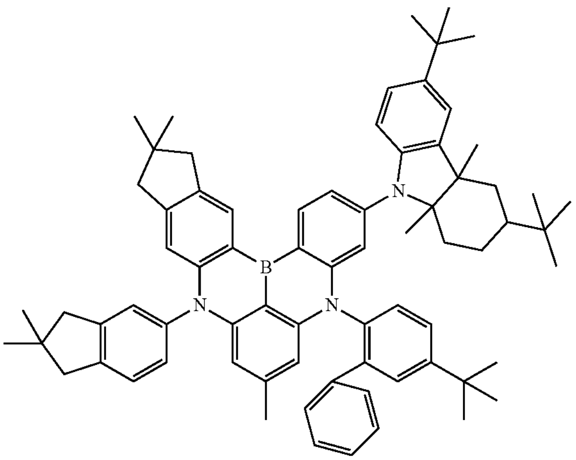

-continued
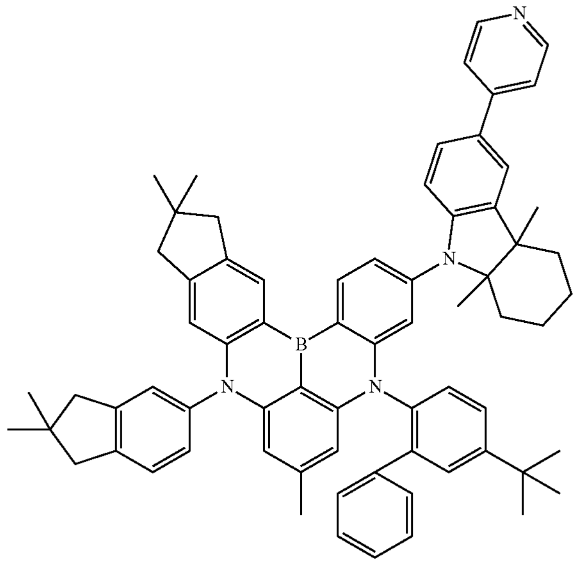
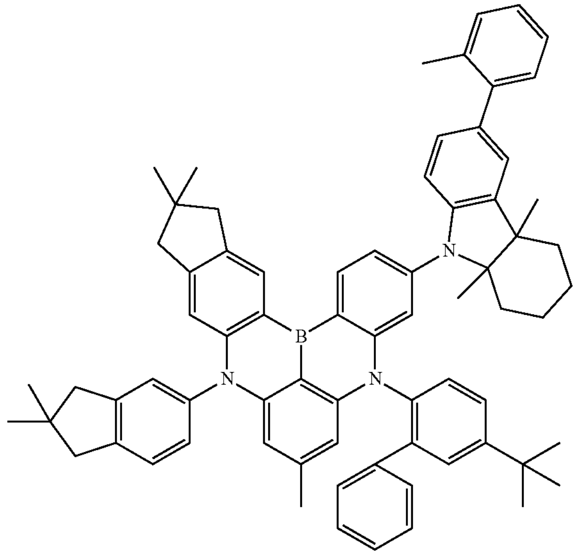
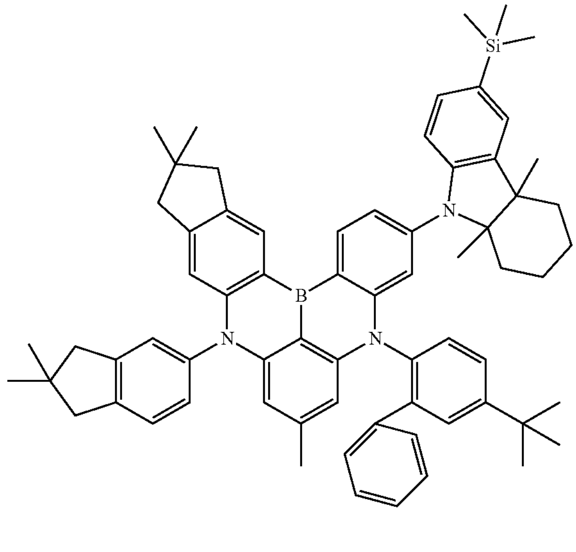
-continued
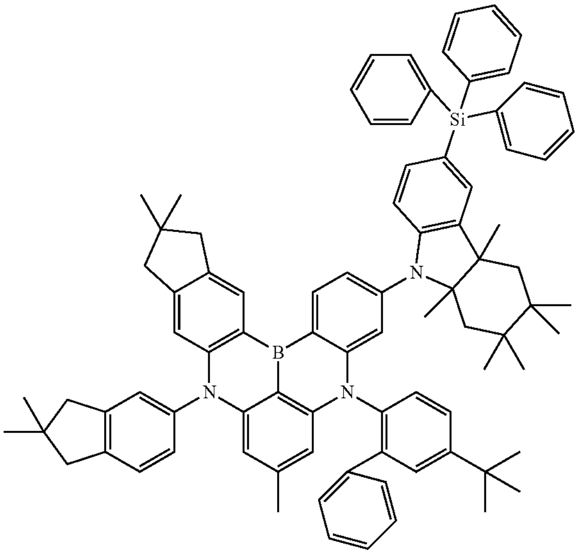
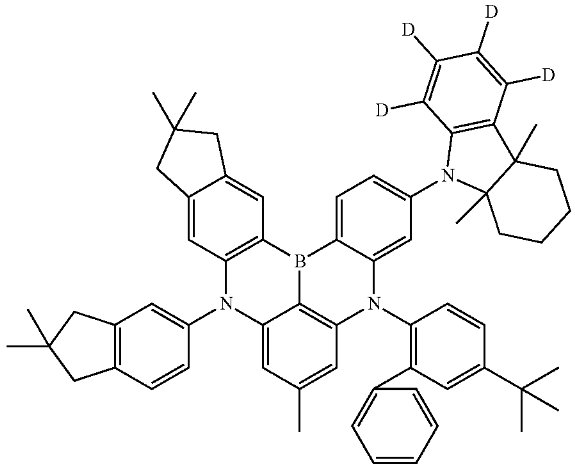
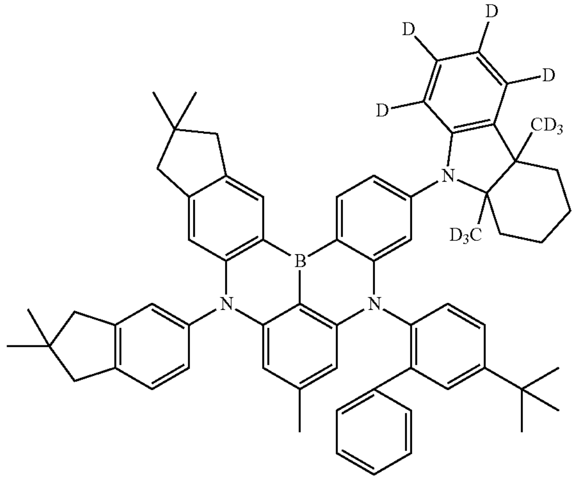

-continued
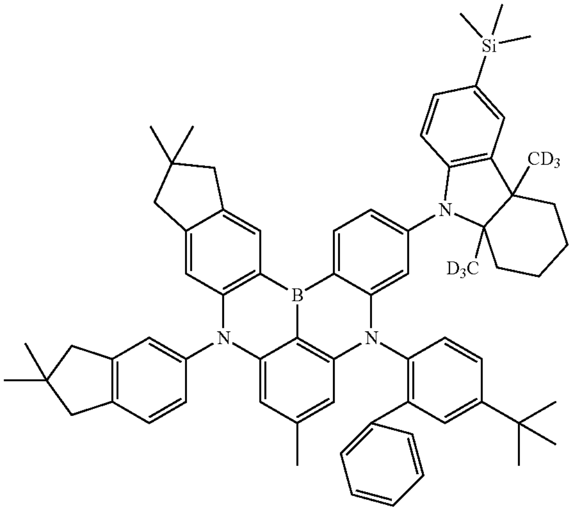
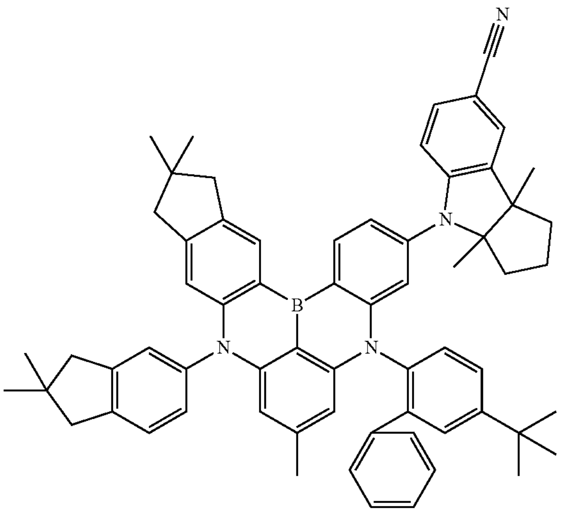
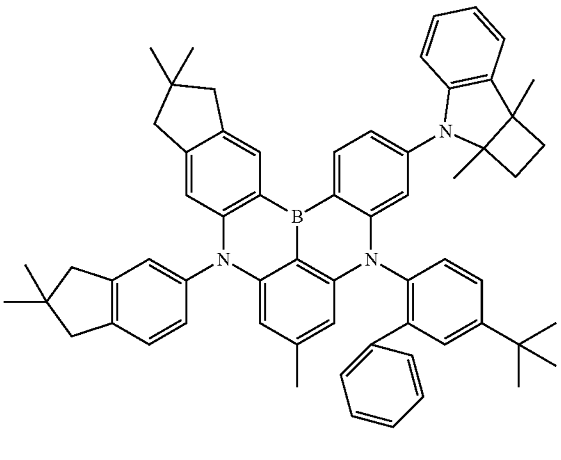
-continued
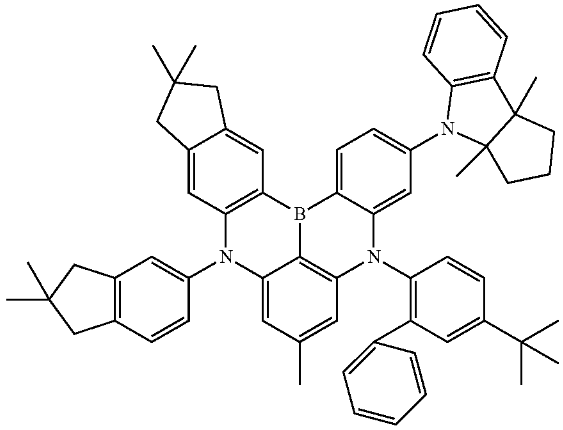
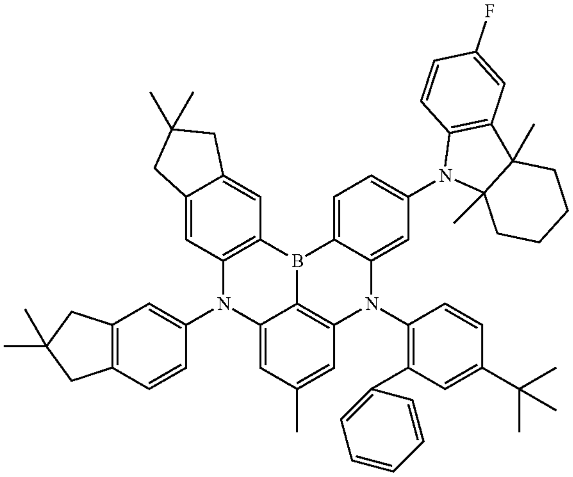
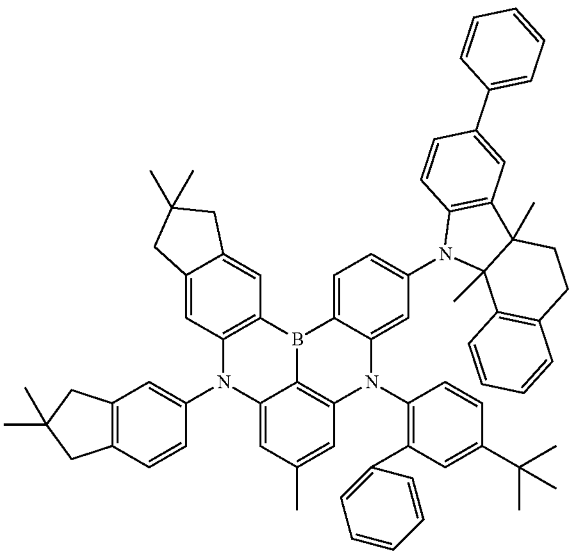

-continued
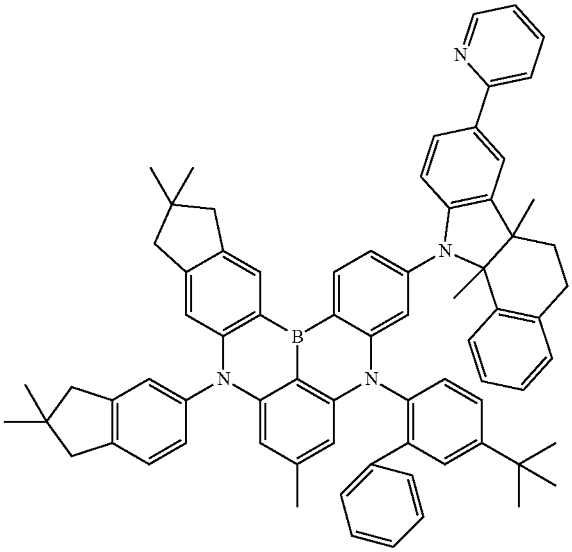
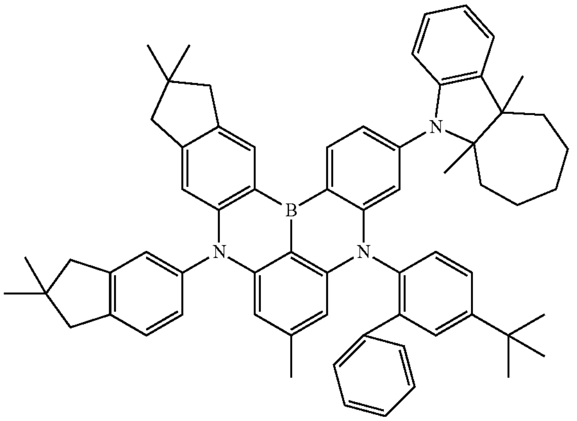
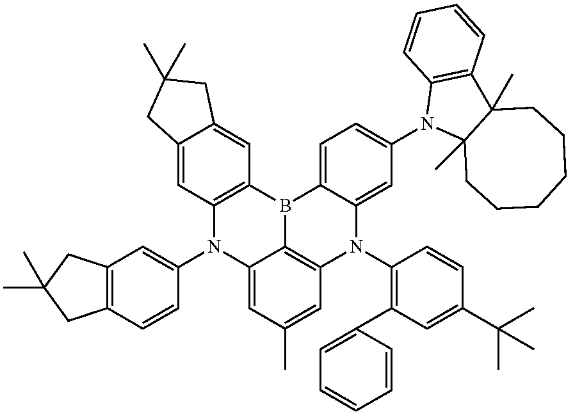
-continued
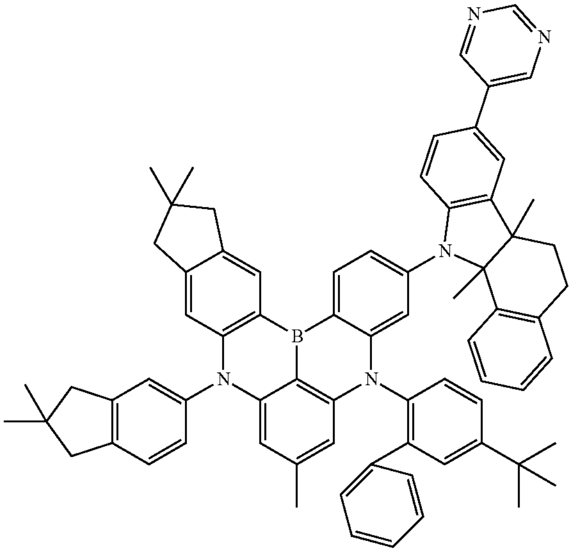
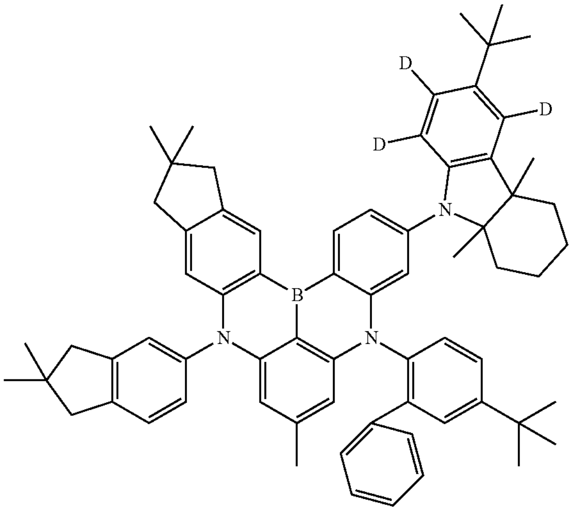
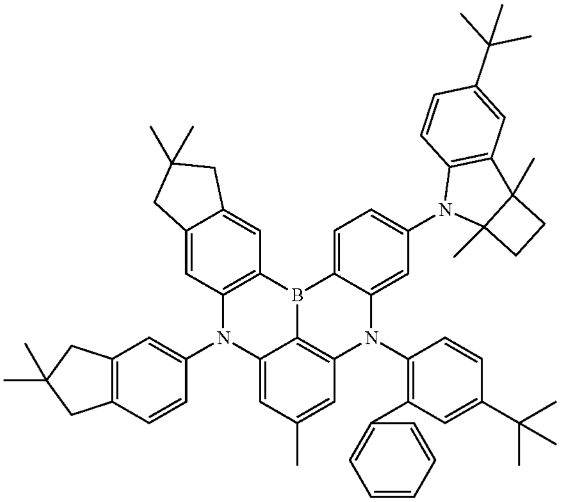

-continued
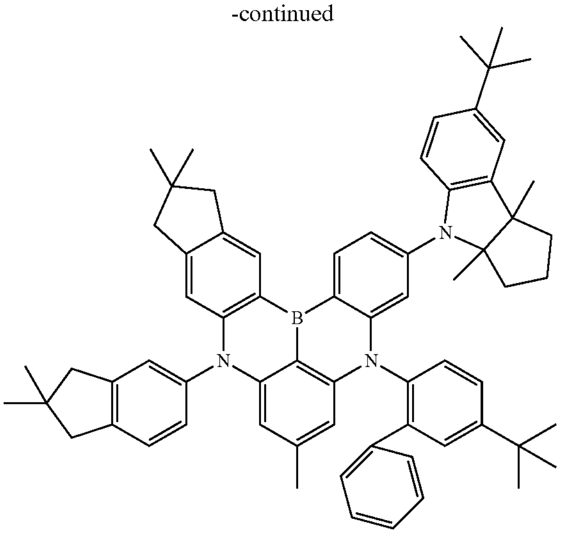
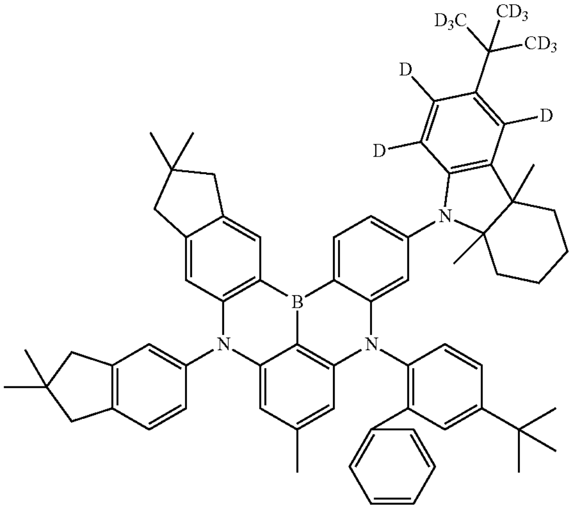
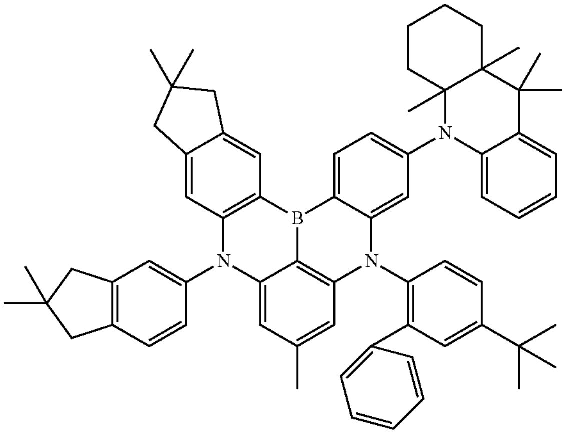
-continued
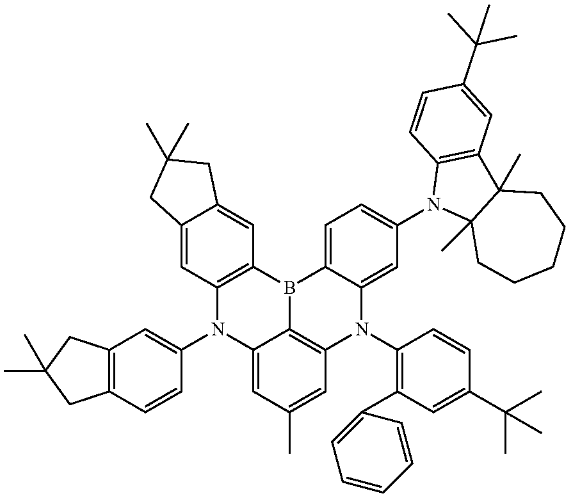
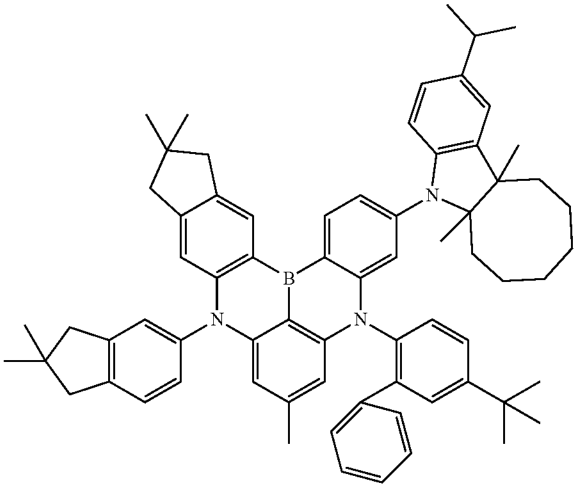
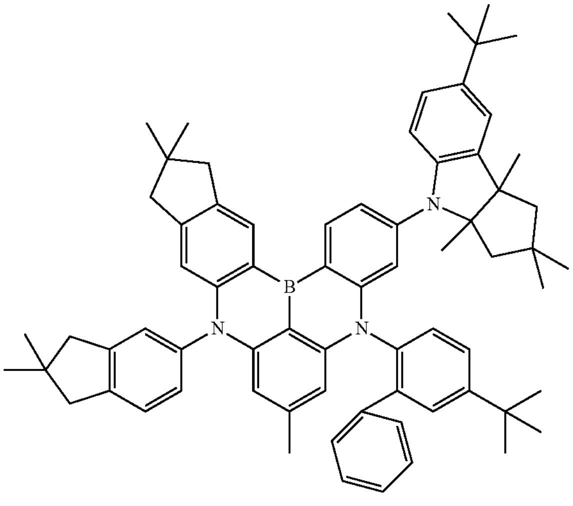

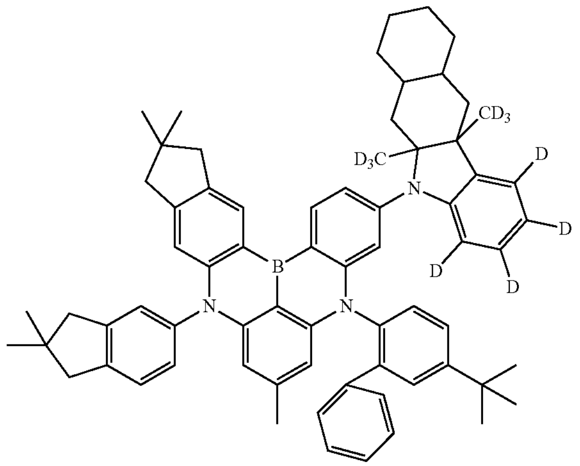
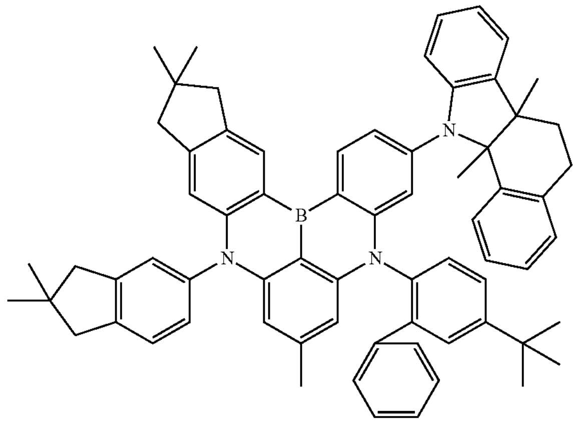
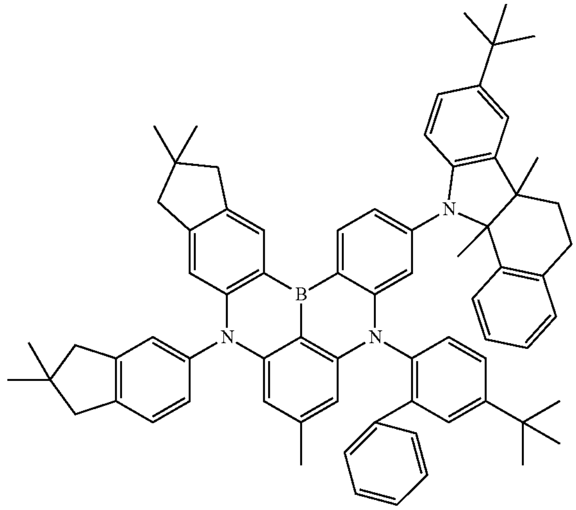
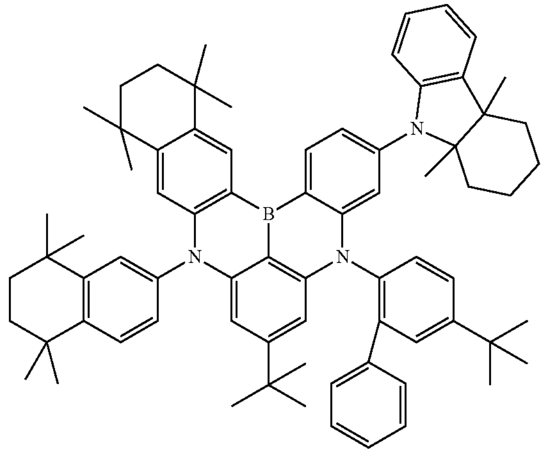
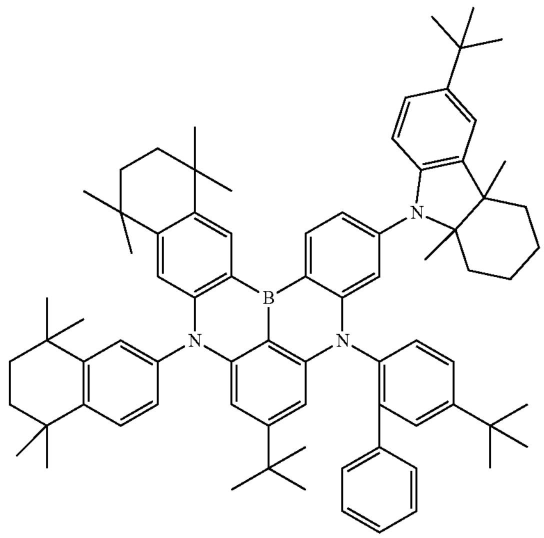
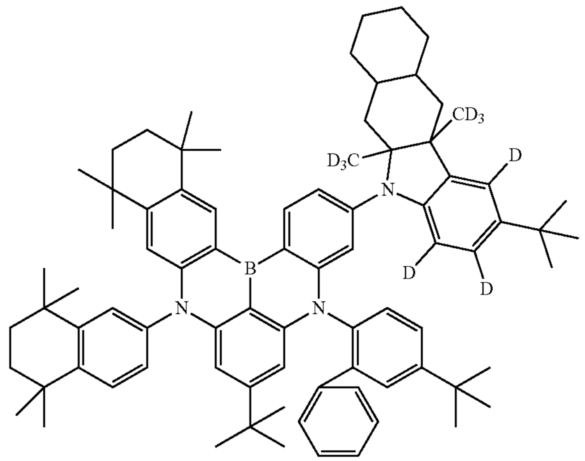

-continued
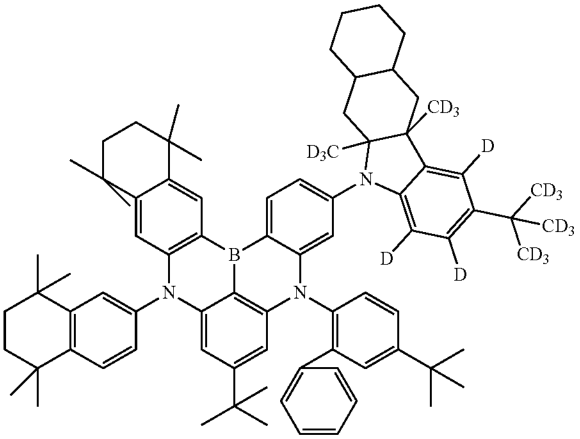
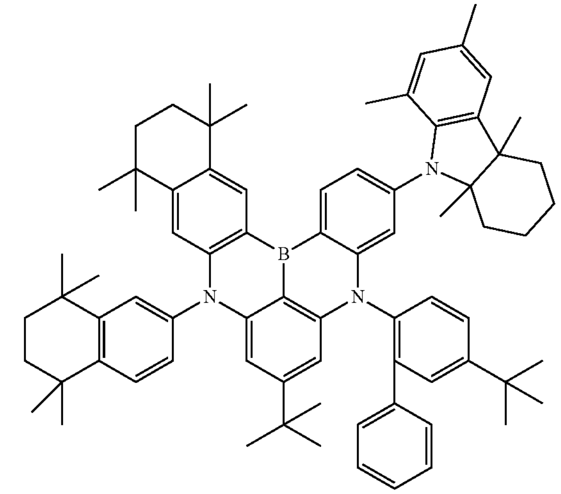
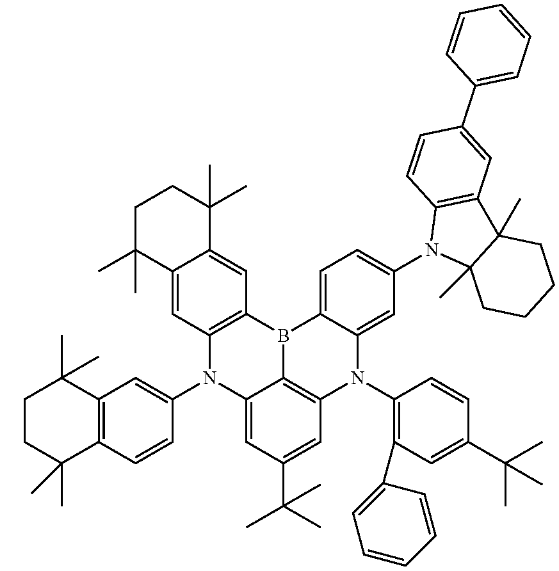
-continued
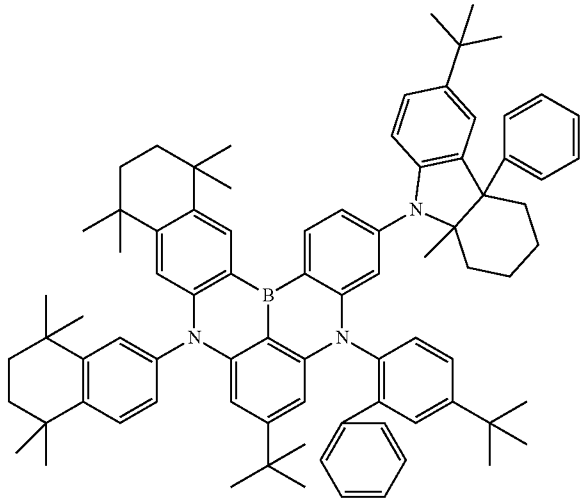
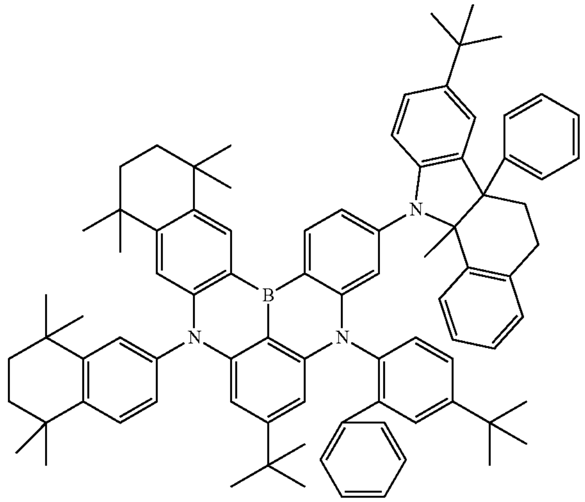
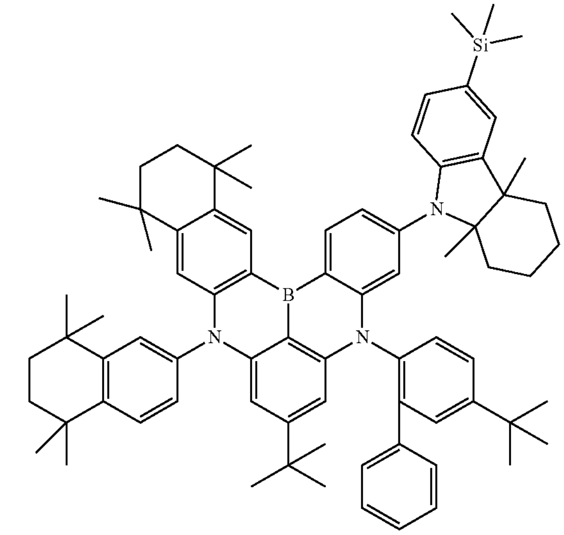

-continued
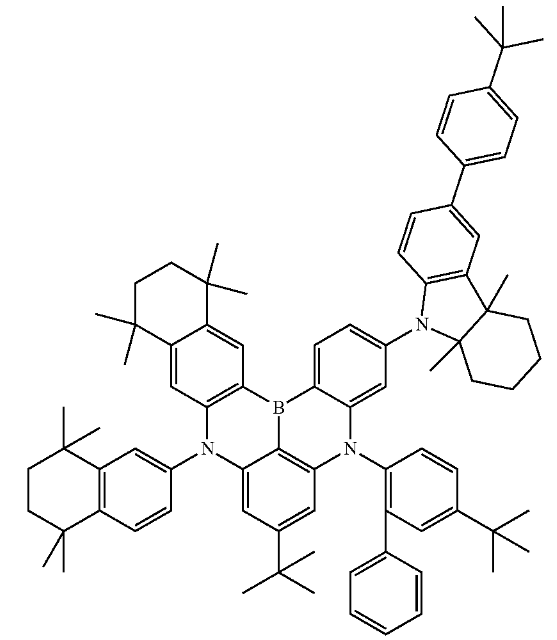
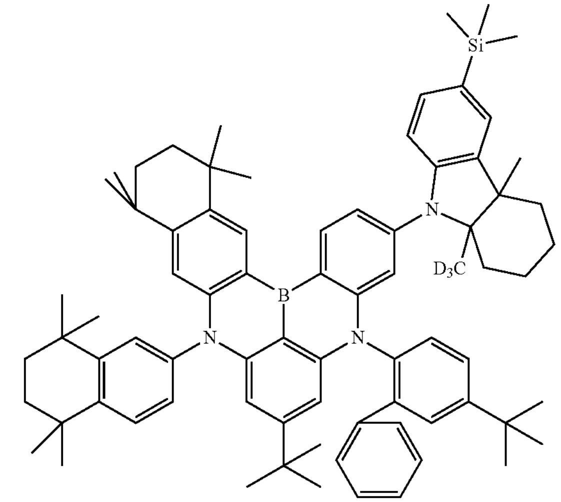
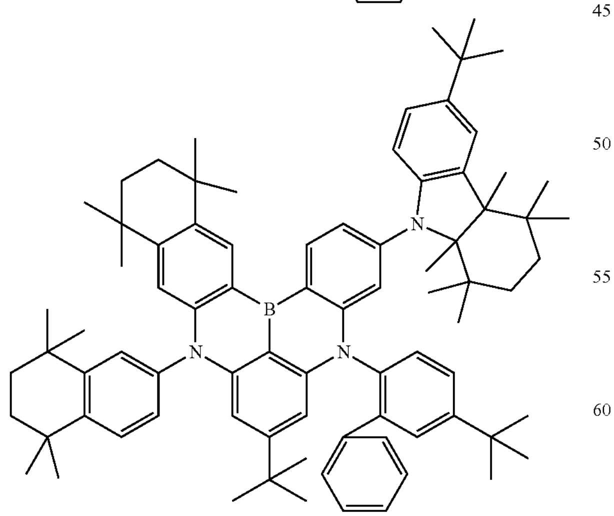
-continued
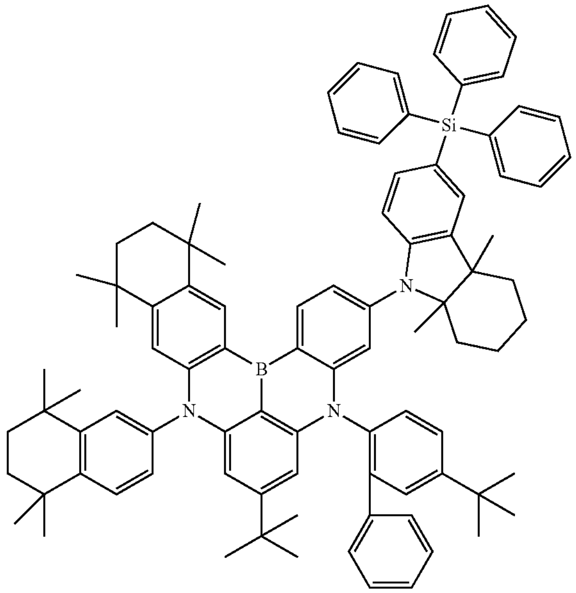
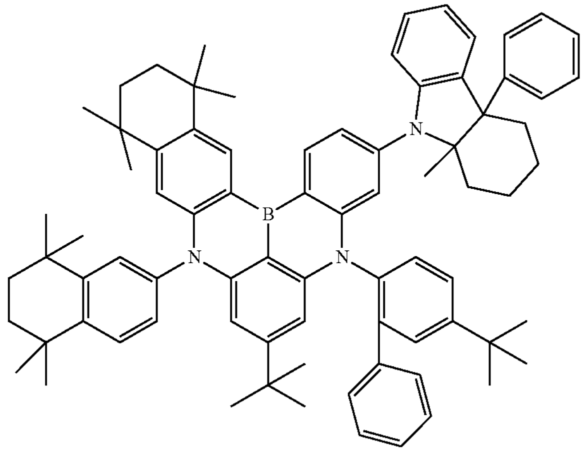
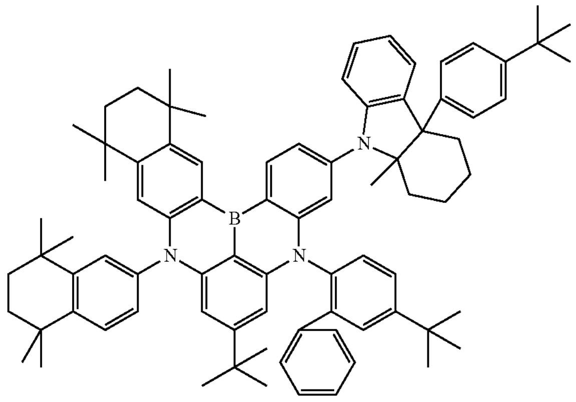

-continued
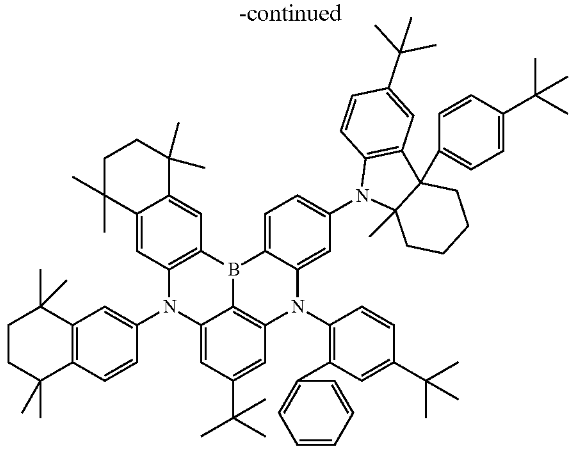
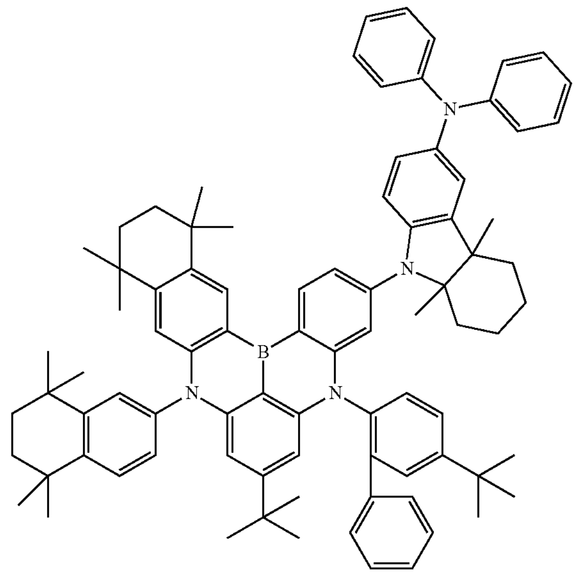
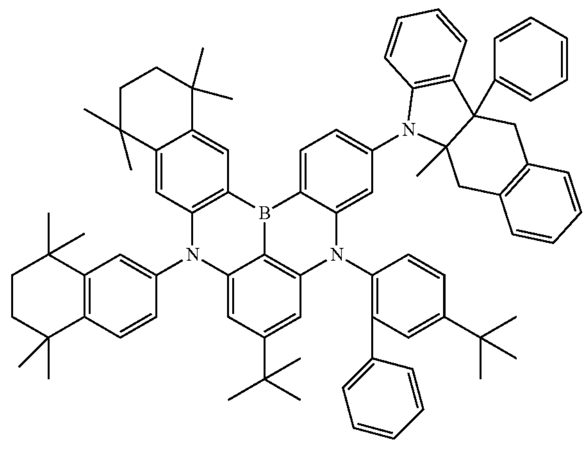
-continued
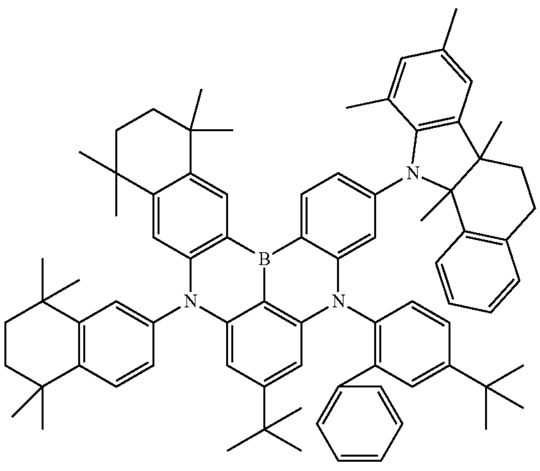
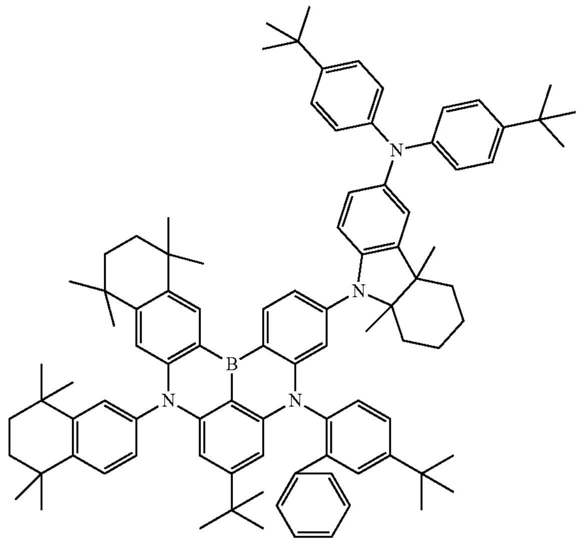
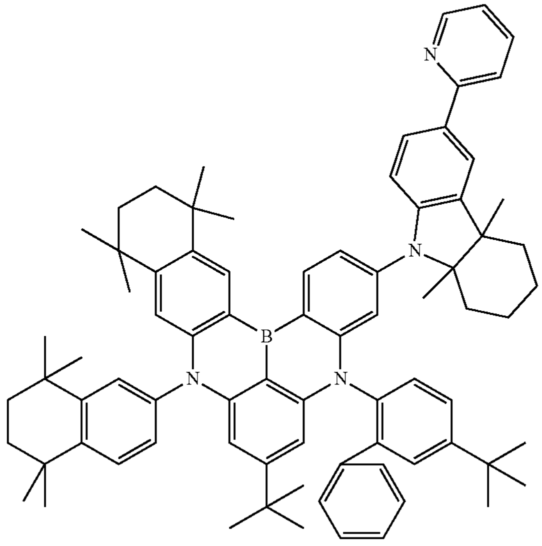

-continued
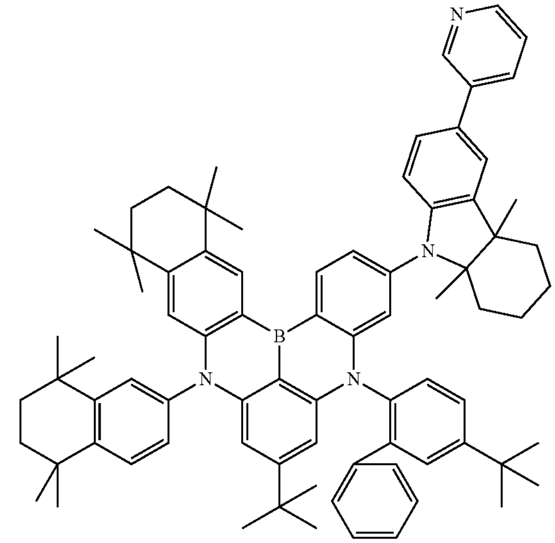
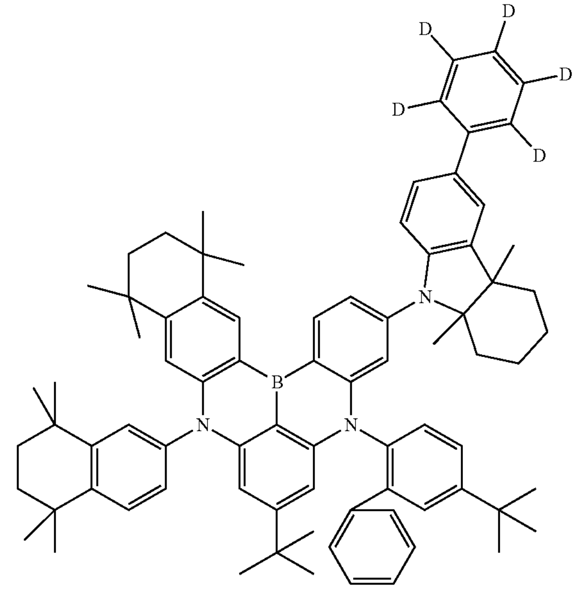
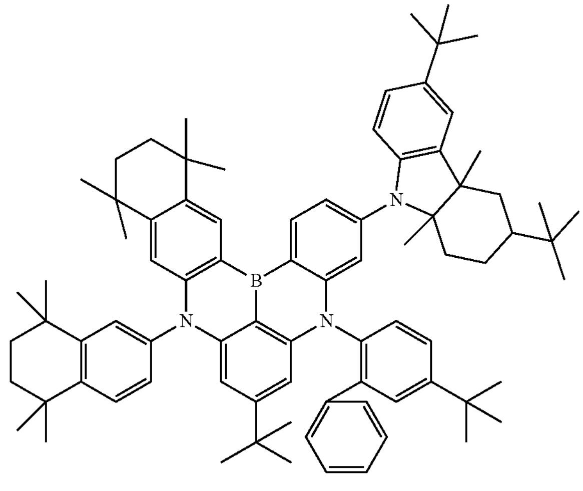
-continued
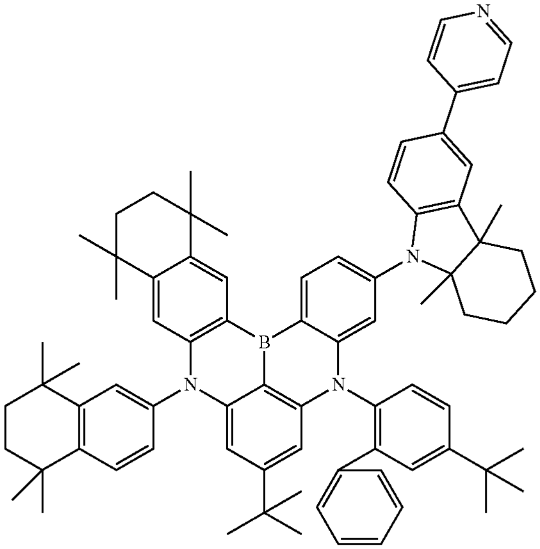
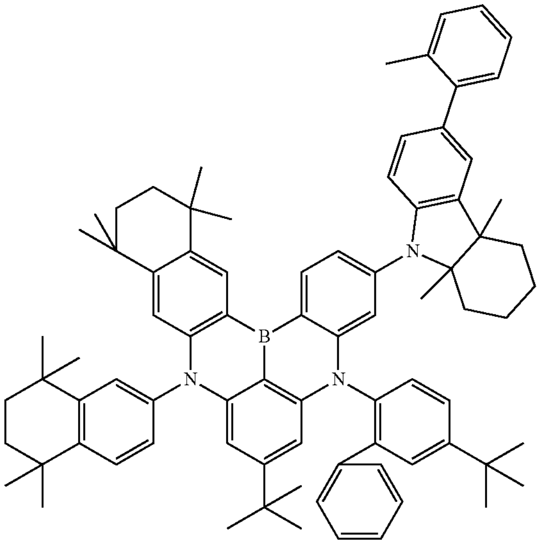
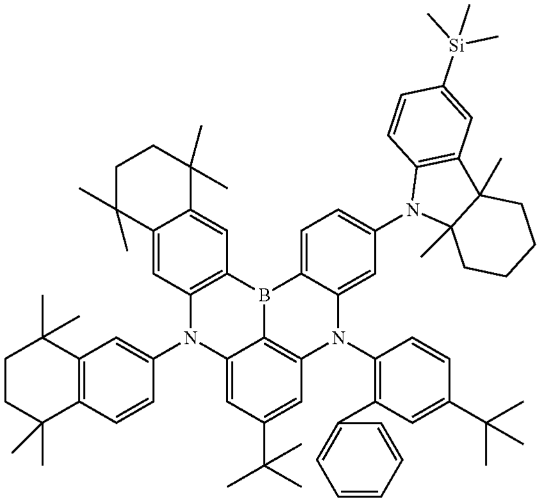

-continued
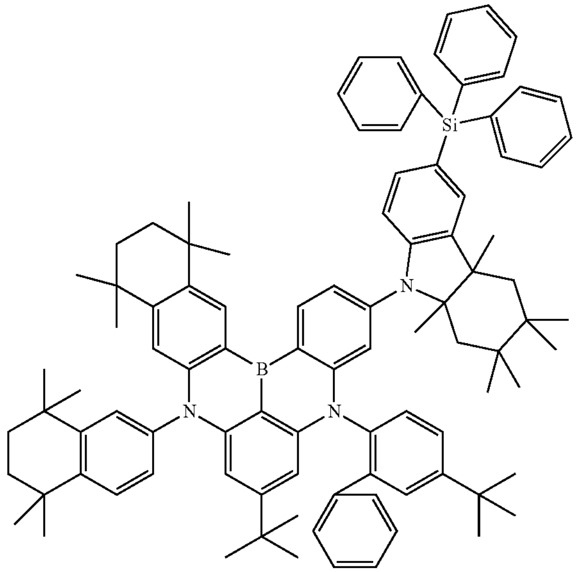
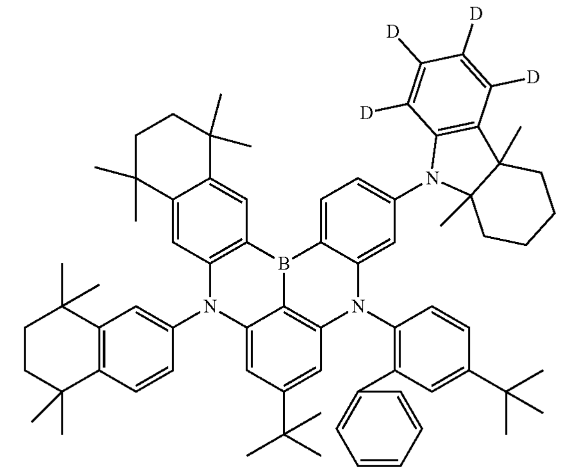
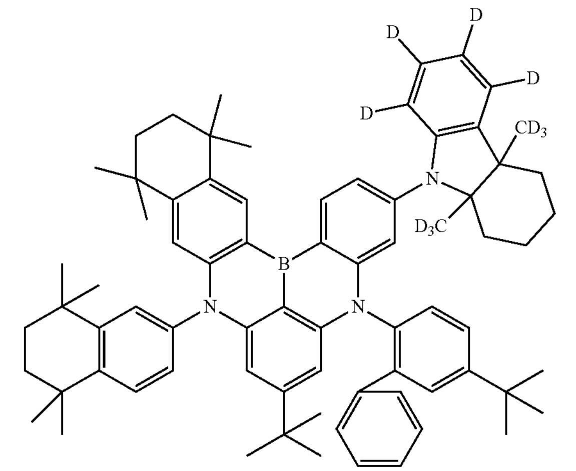
-continued
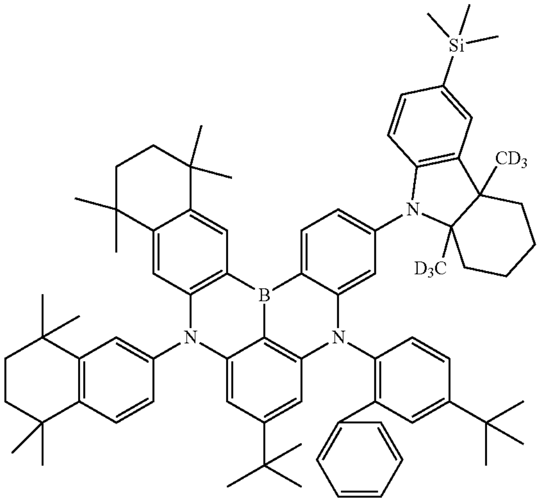
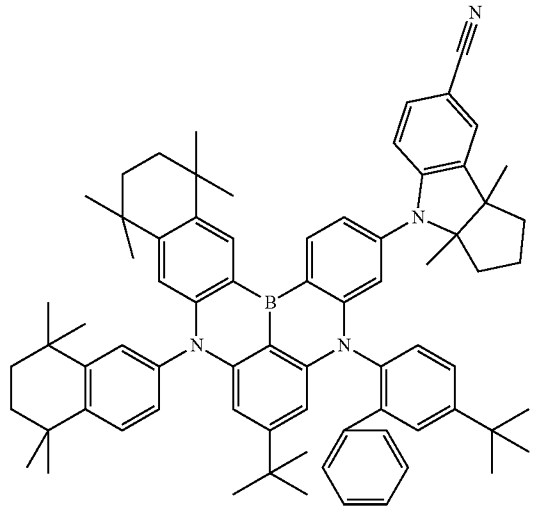
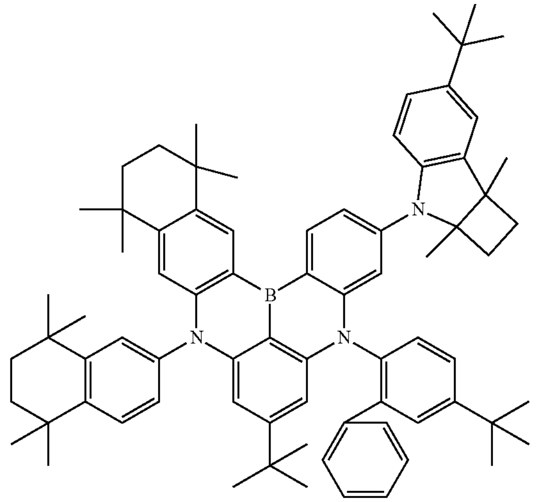

-continued
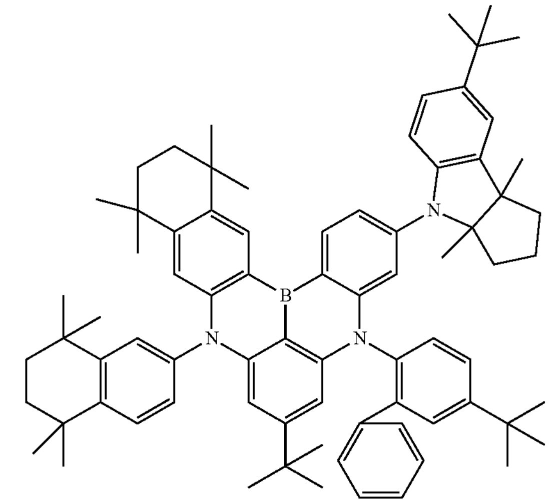
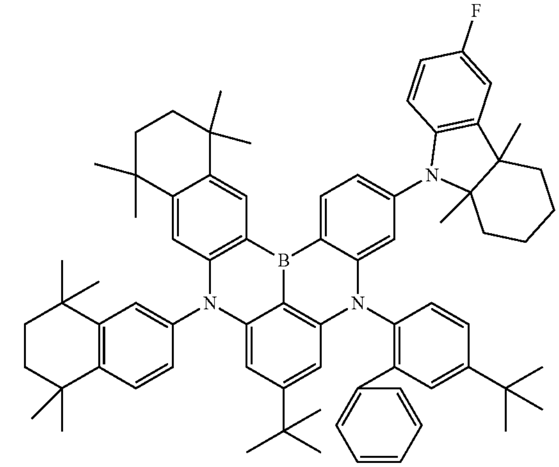
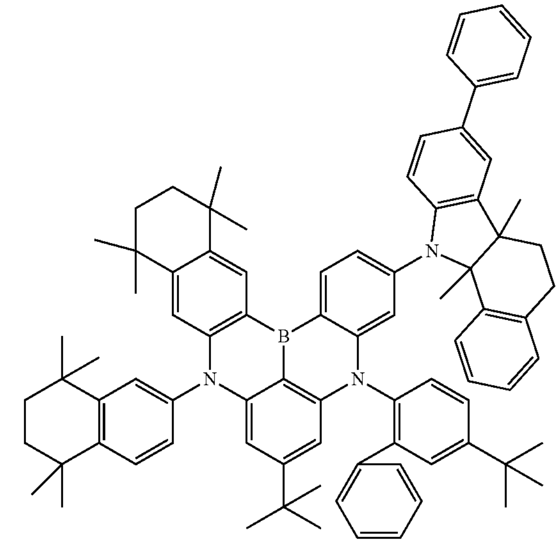
-continued
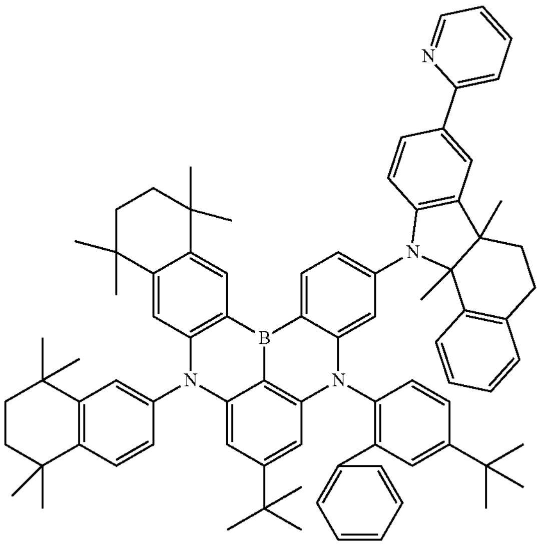
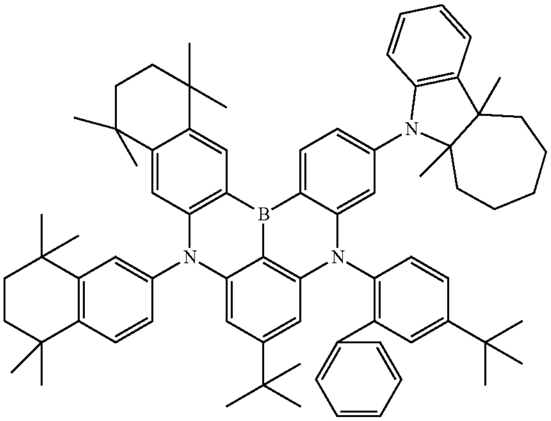
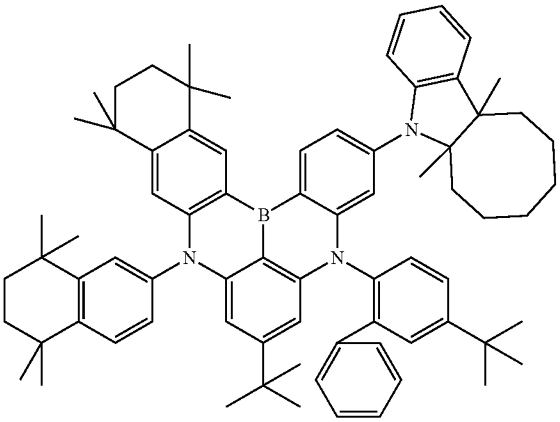

-continued
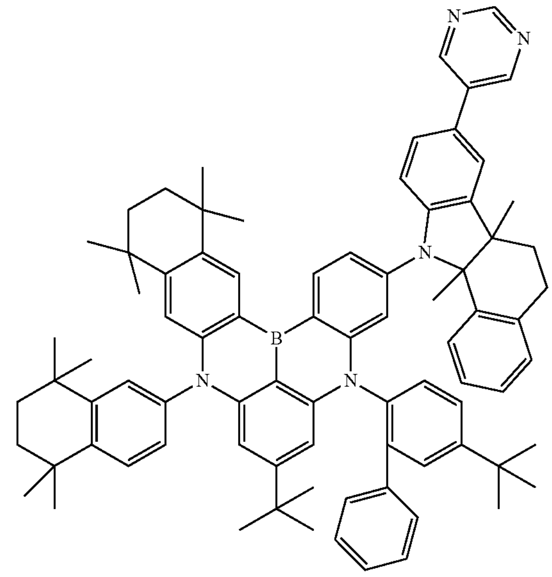
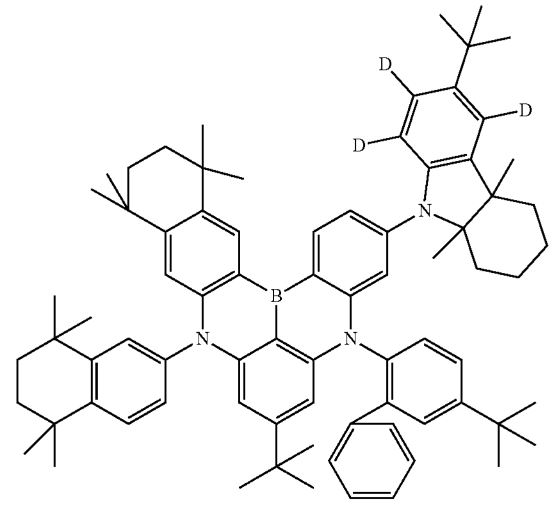
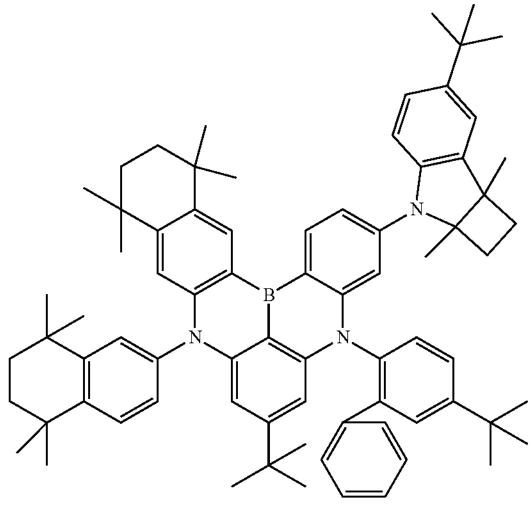
-continued
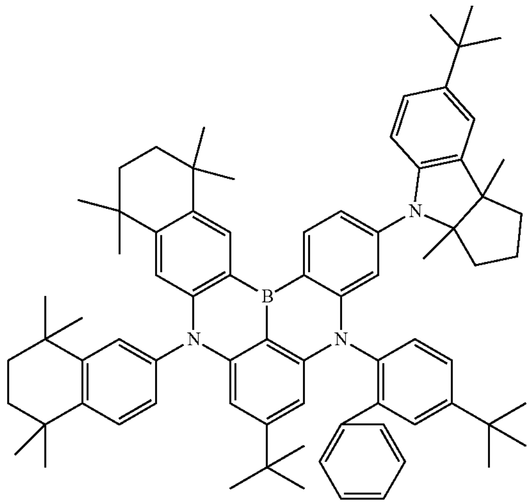
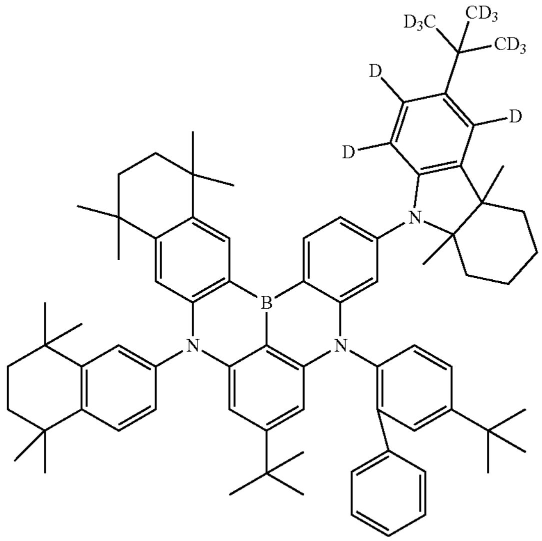
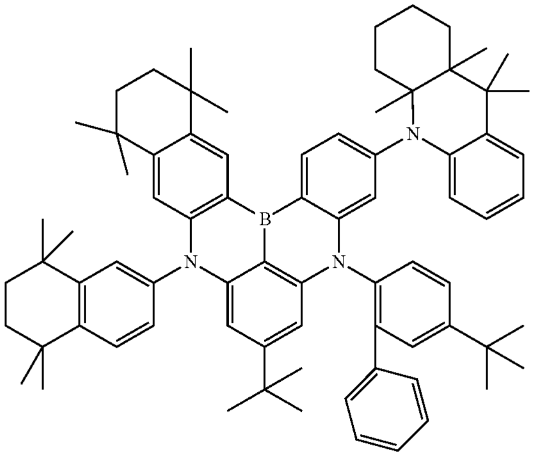

-continued
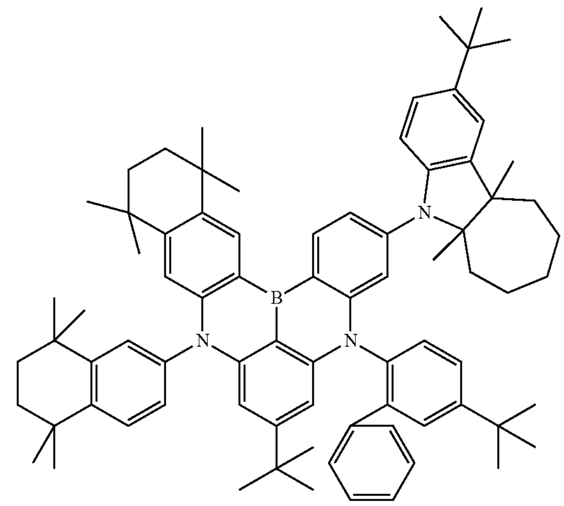
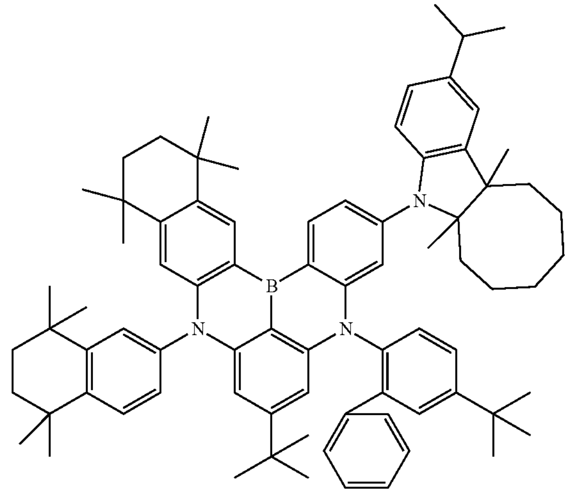
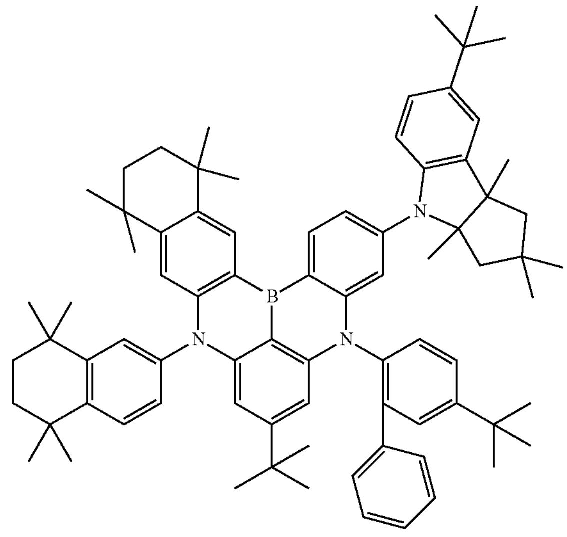
-continued
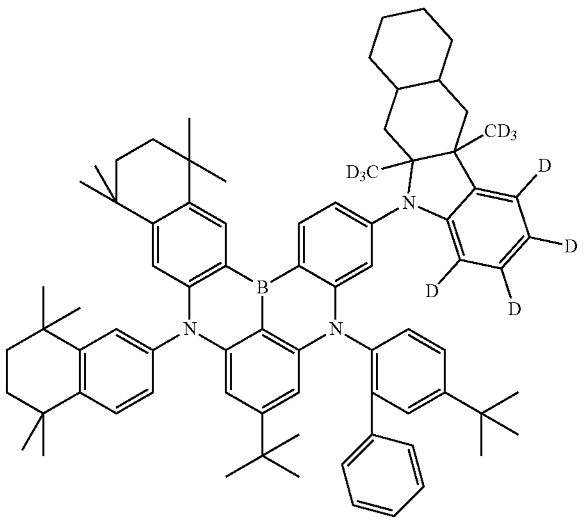
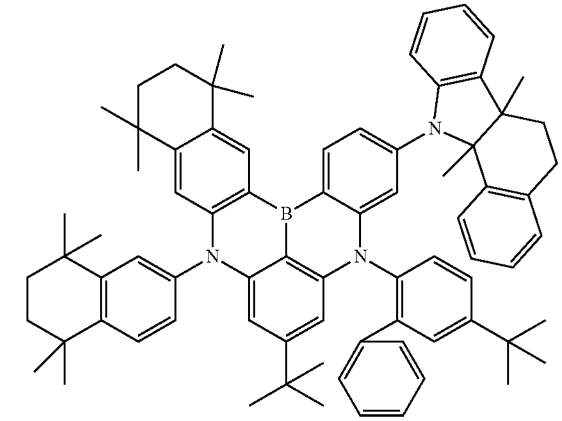
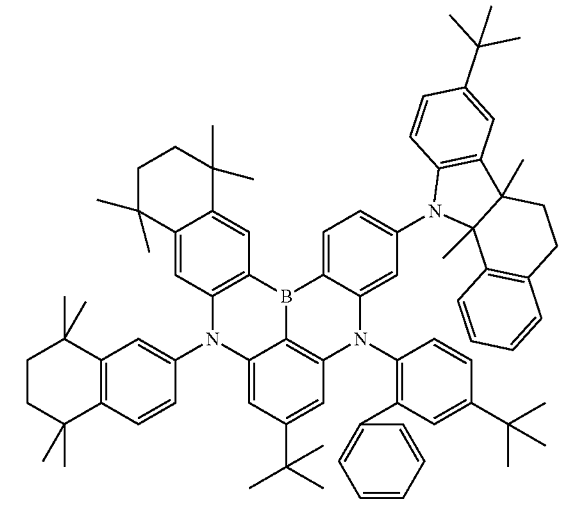

-continued
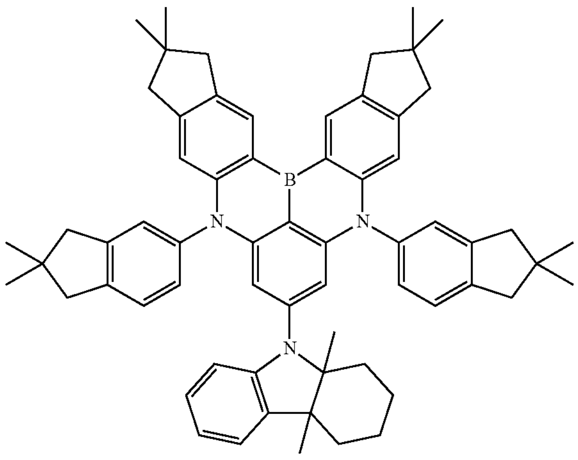
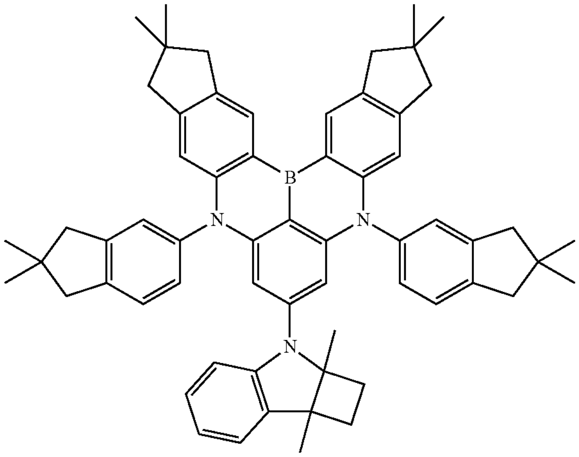
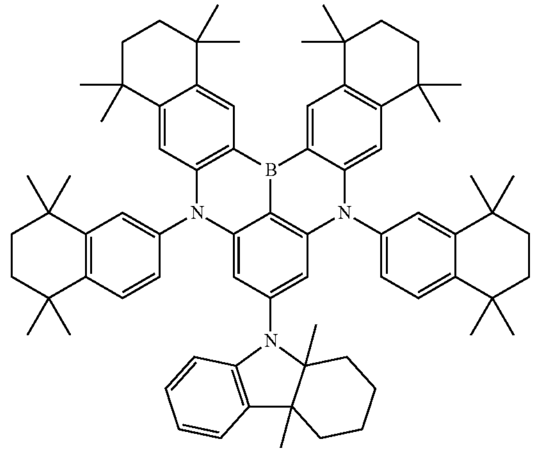
-continued
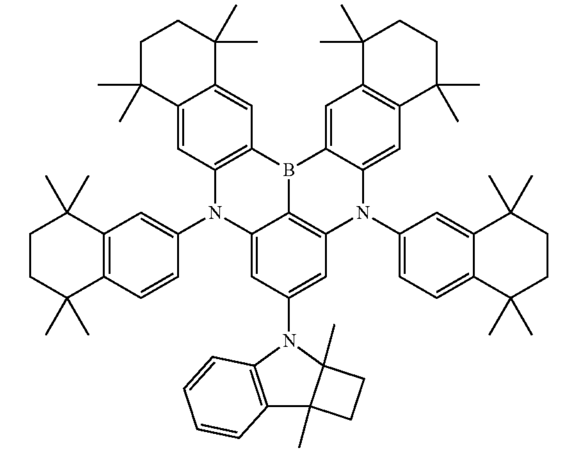
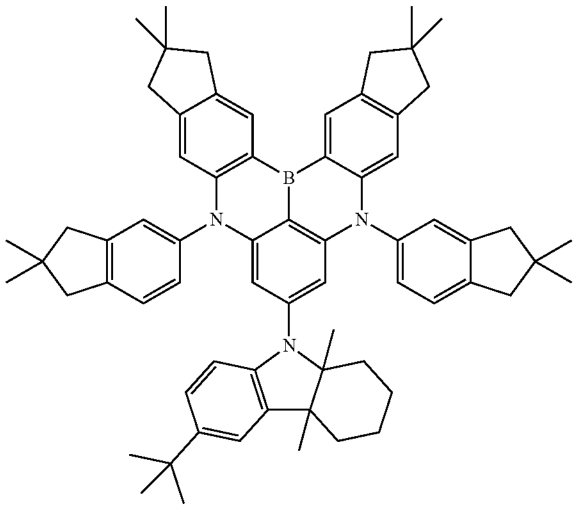
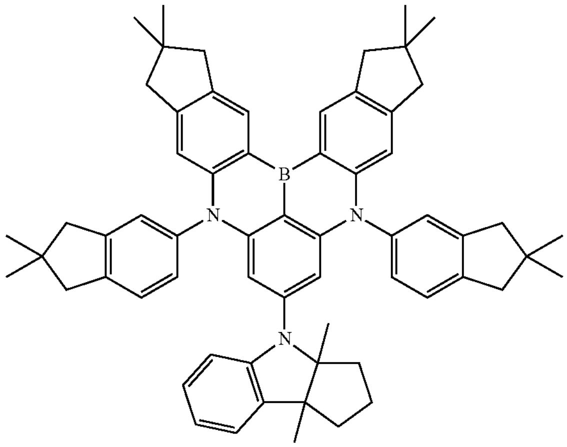

-continued
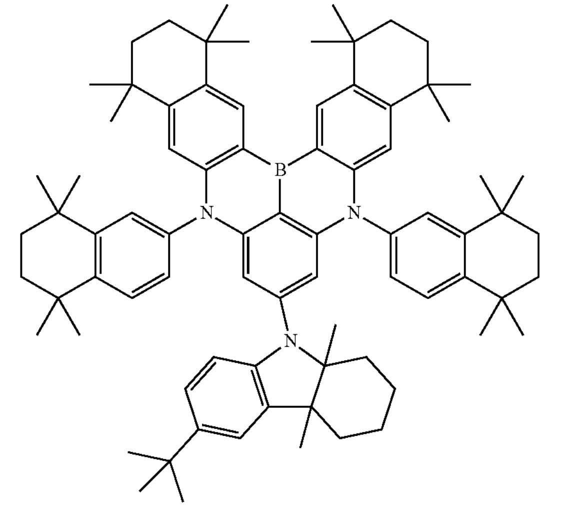
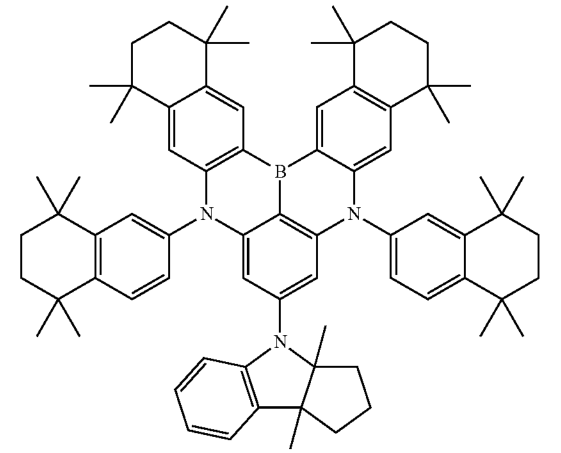
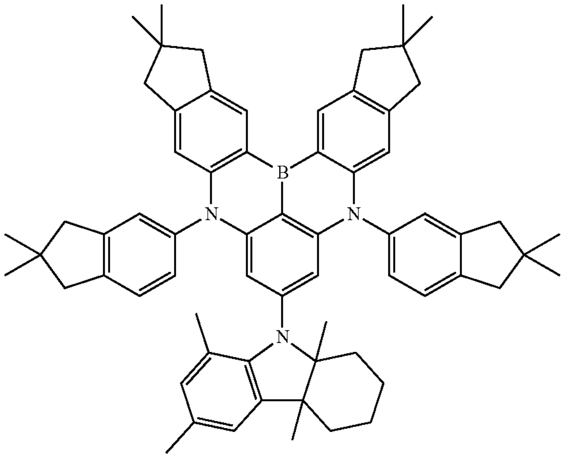
-continued
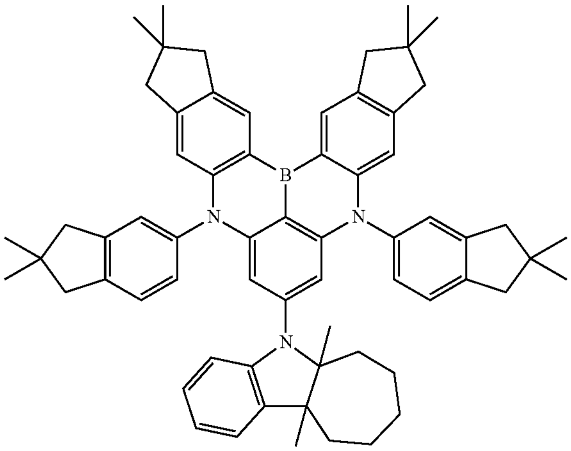
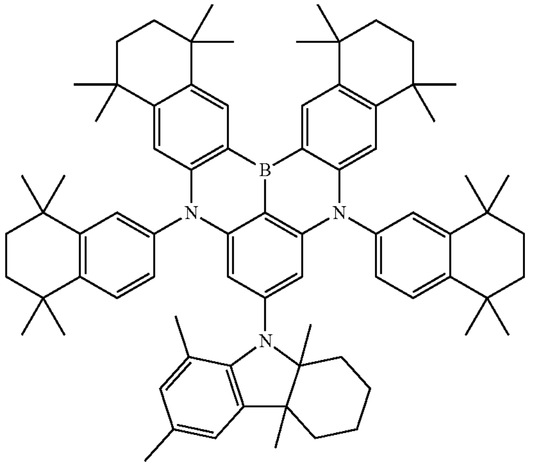
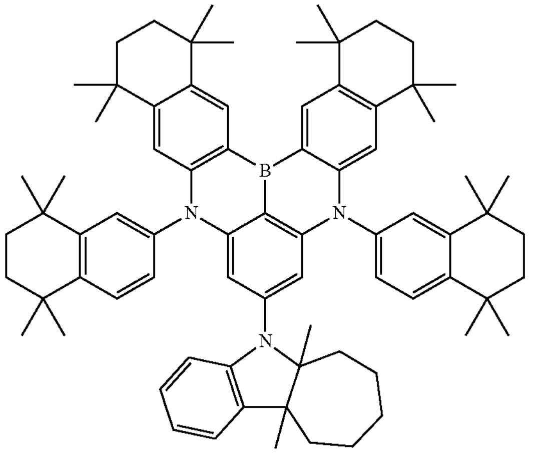

-continued
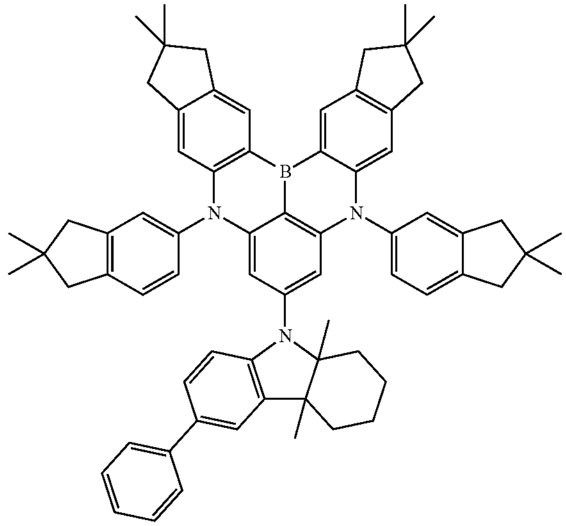
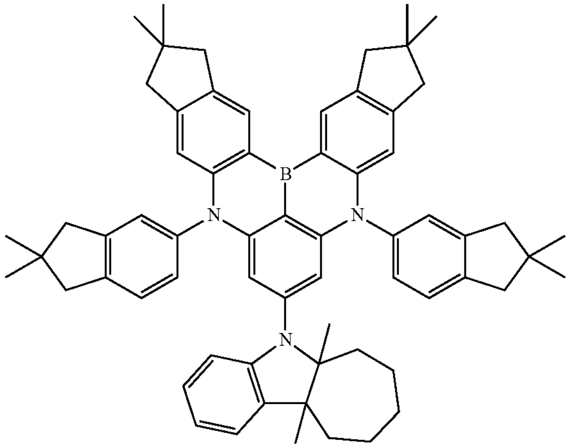
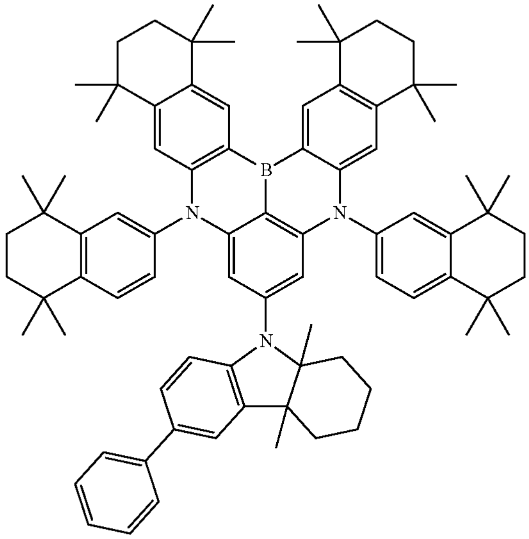
-continued
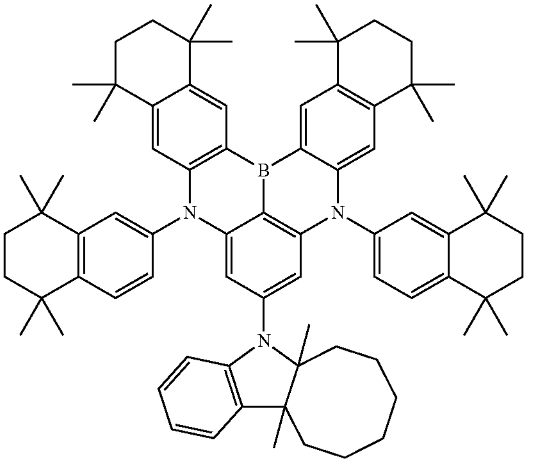
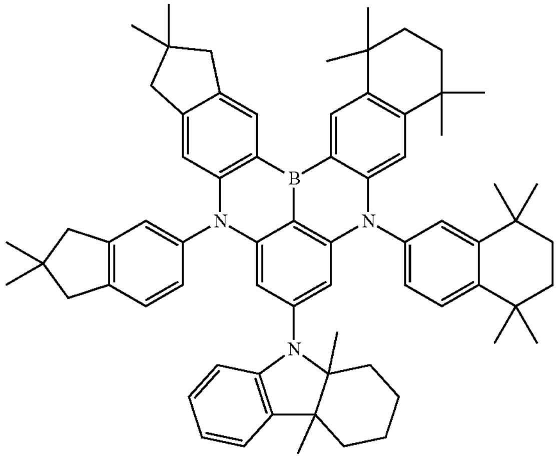
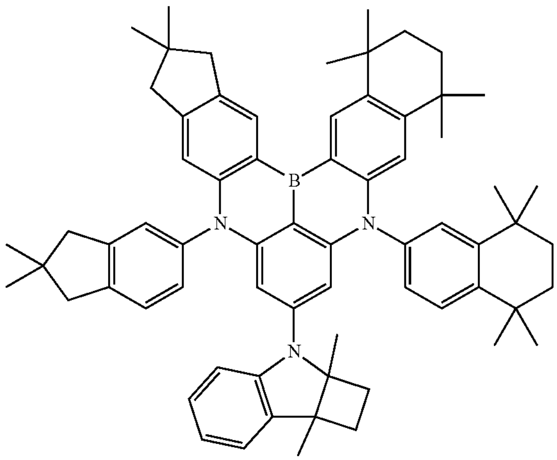

-continued
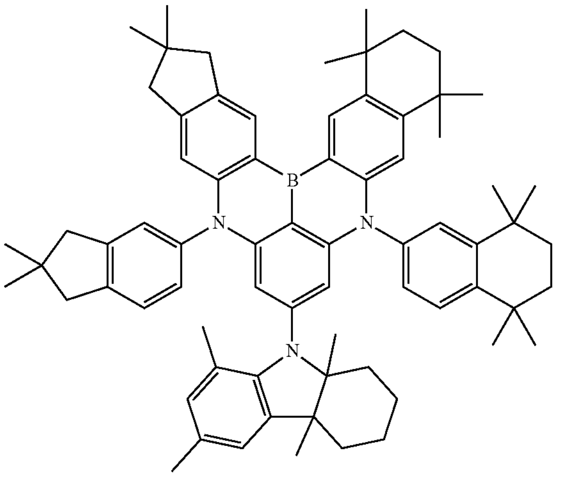
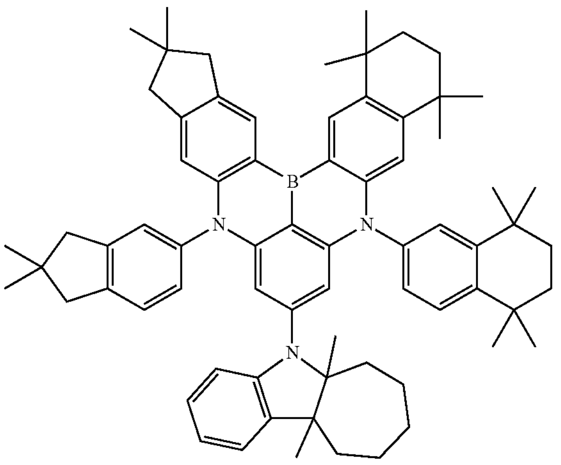
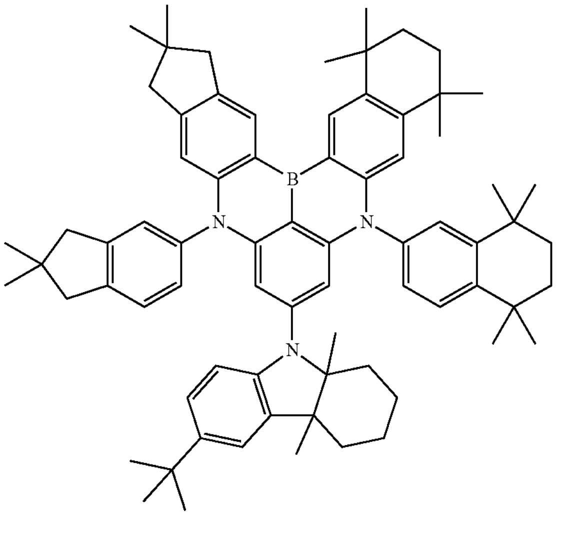
-continued
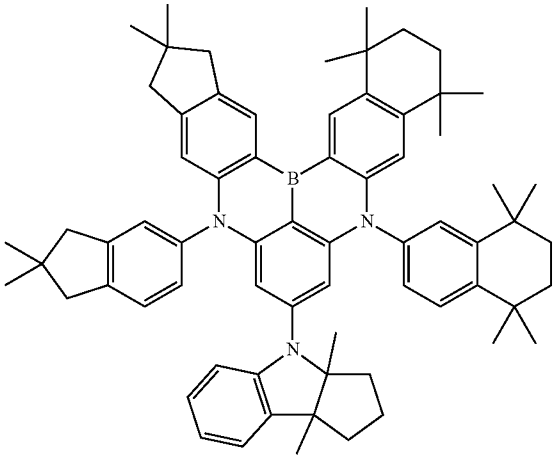
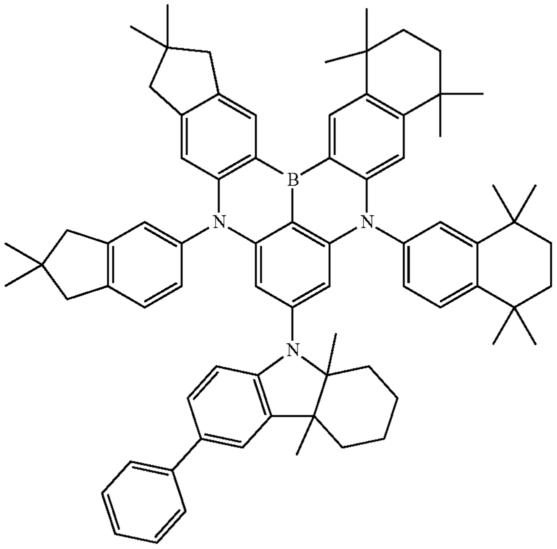
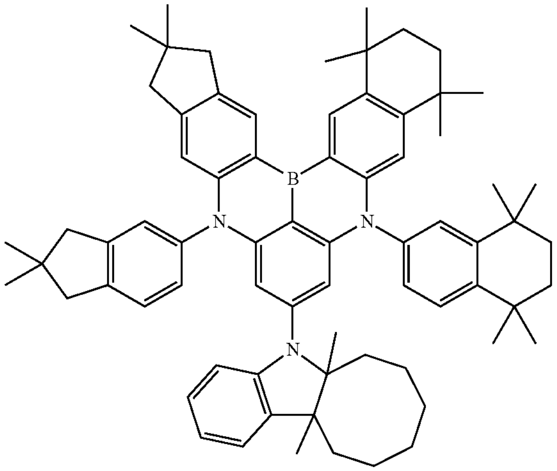

-continued
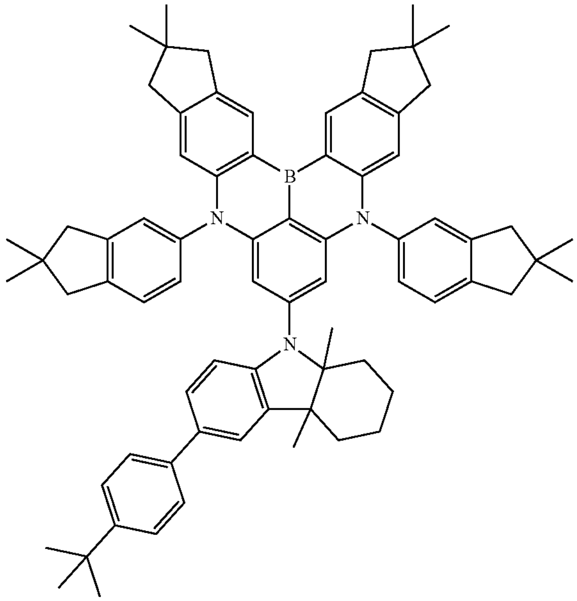
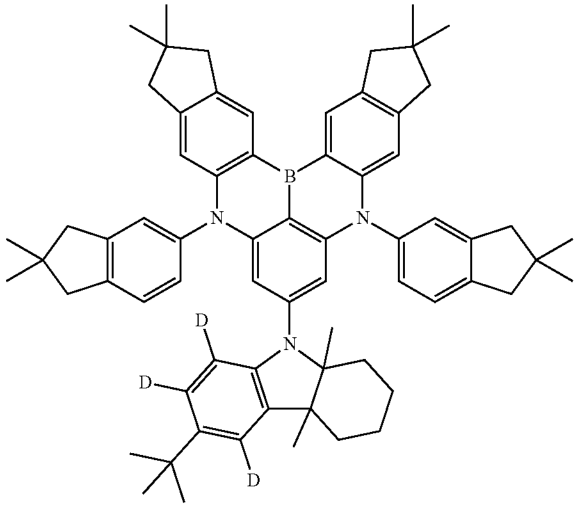
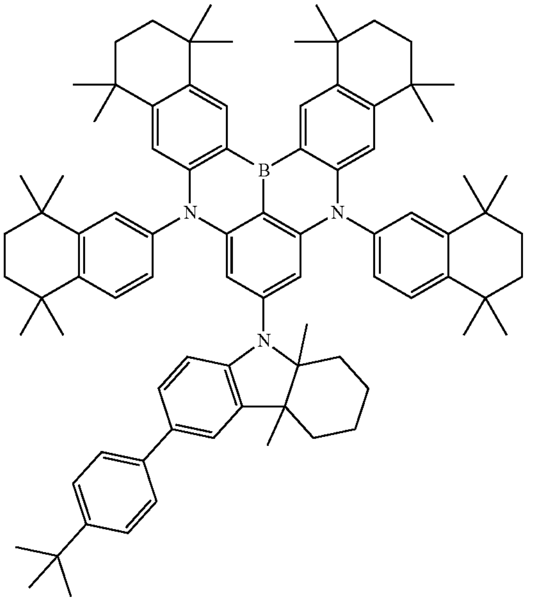
-continued
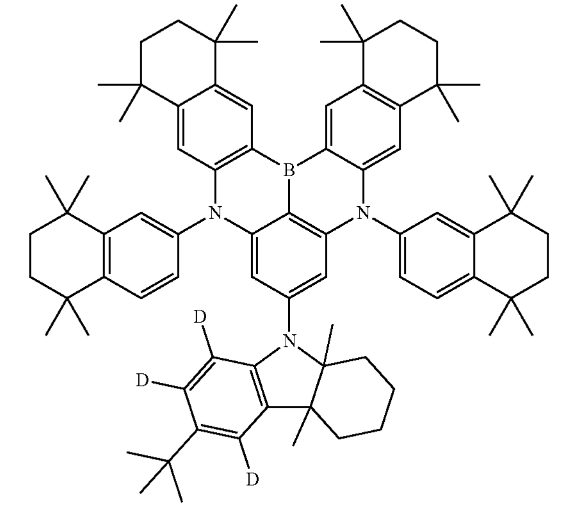
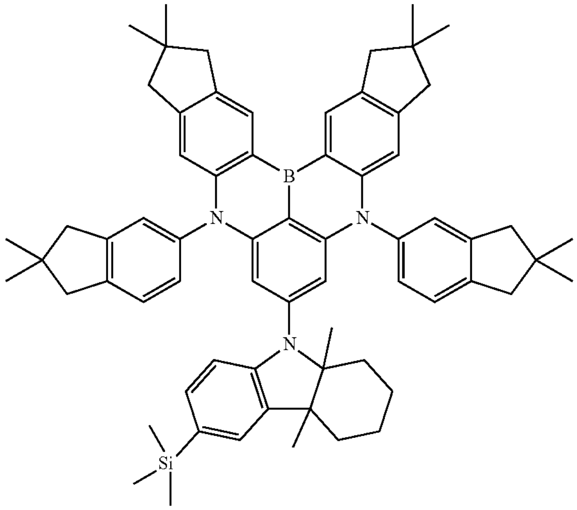
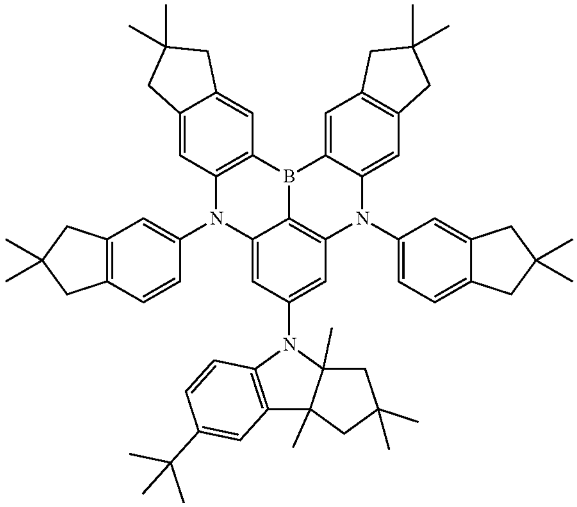

-continued
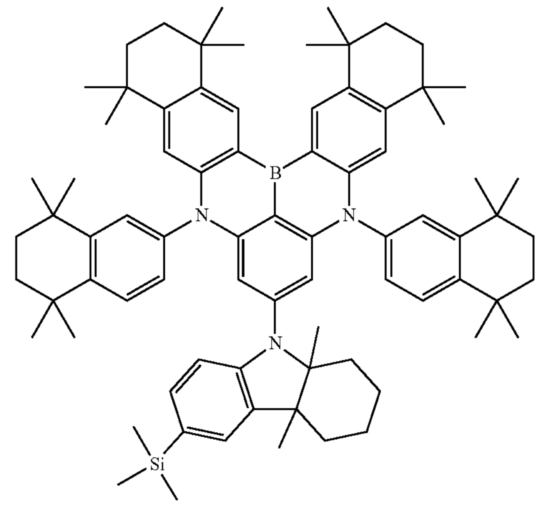
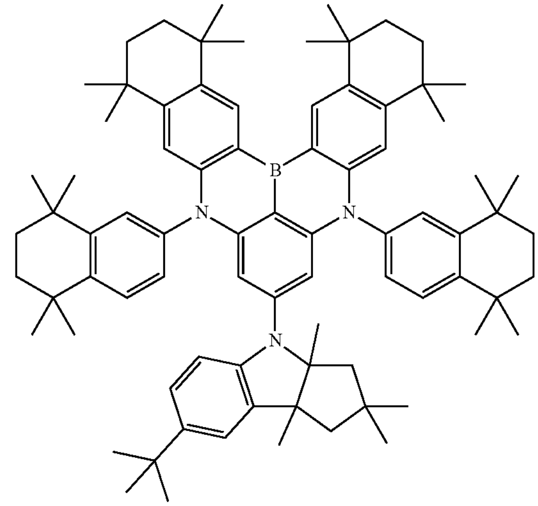
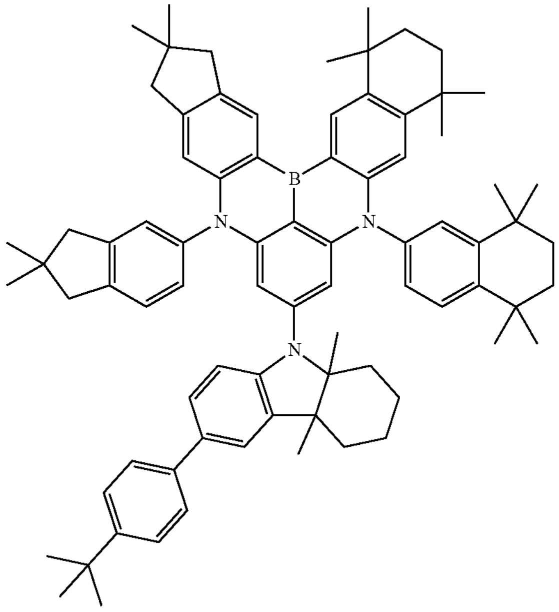
-continued
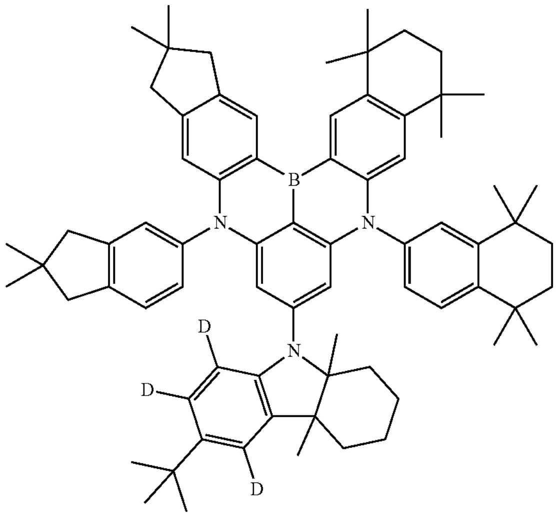
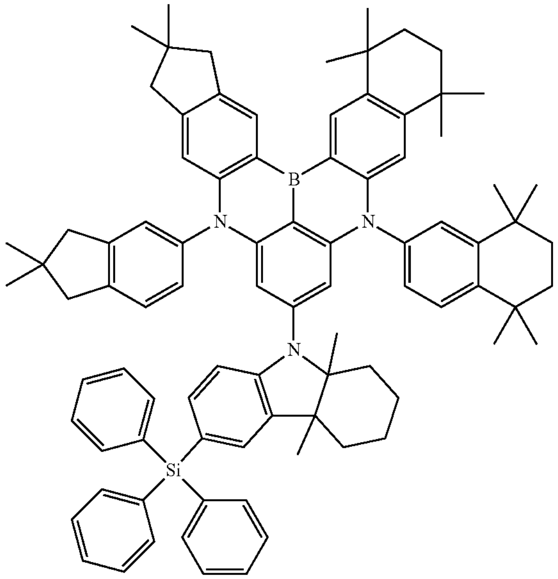
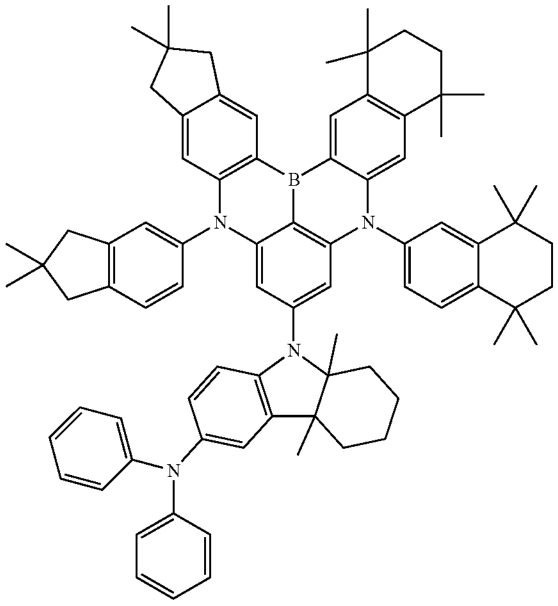

-continued
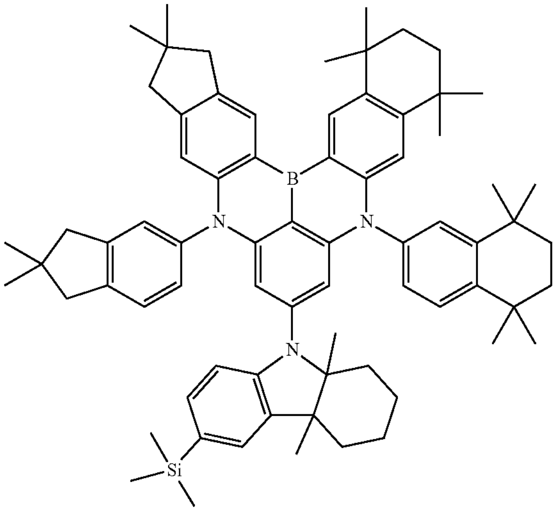
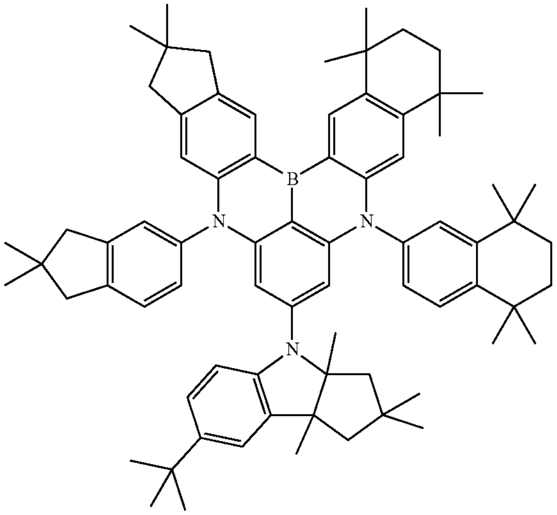
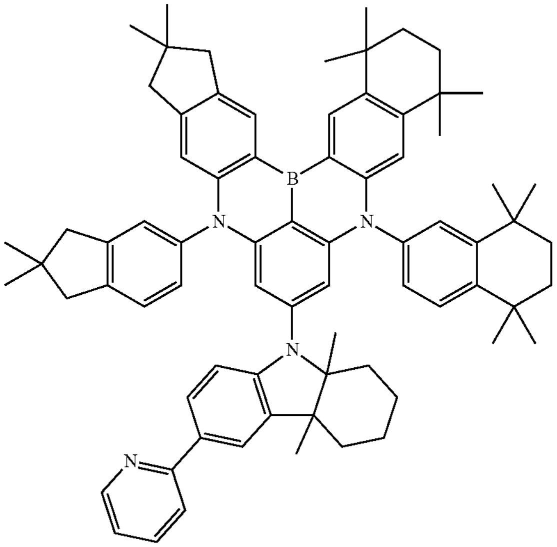
-continued
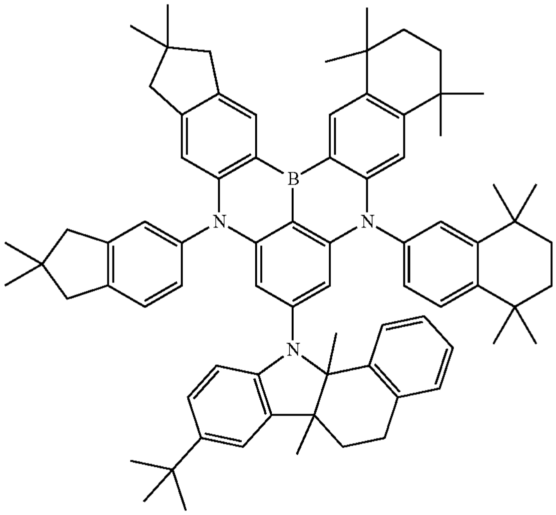
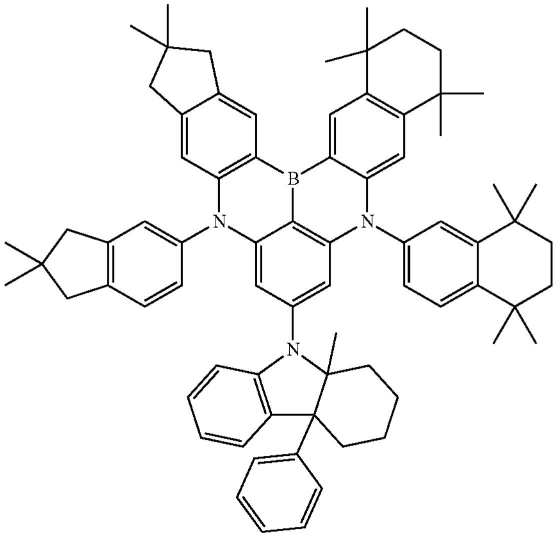
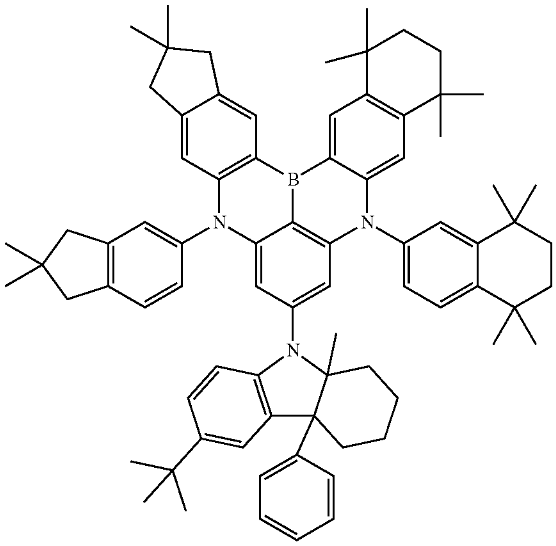

-continued
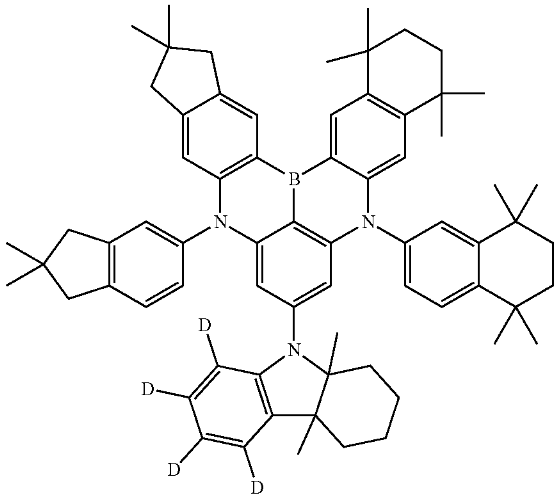
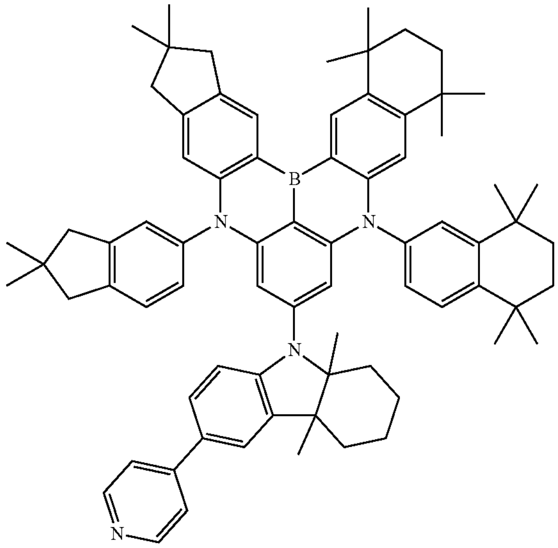
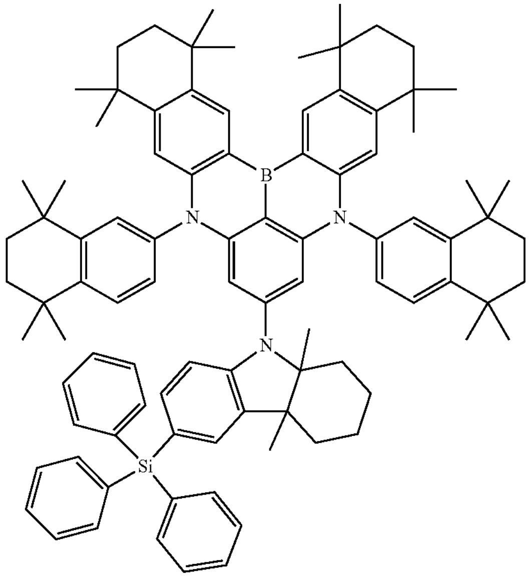
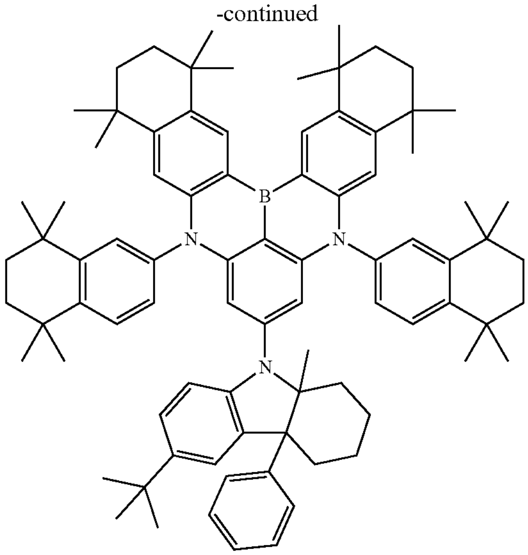
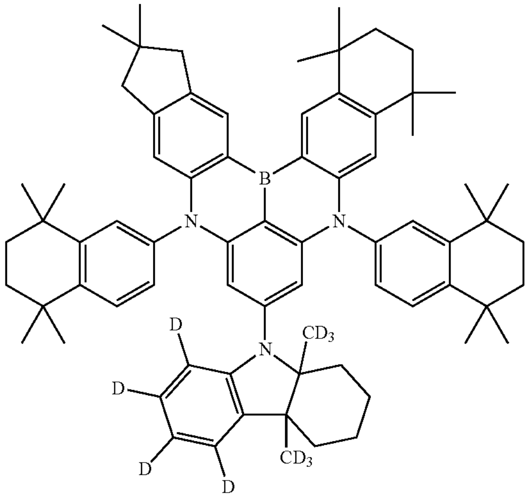
-continued
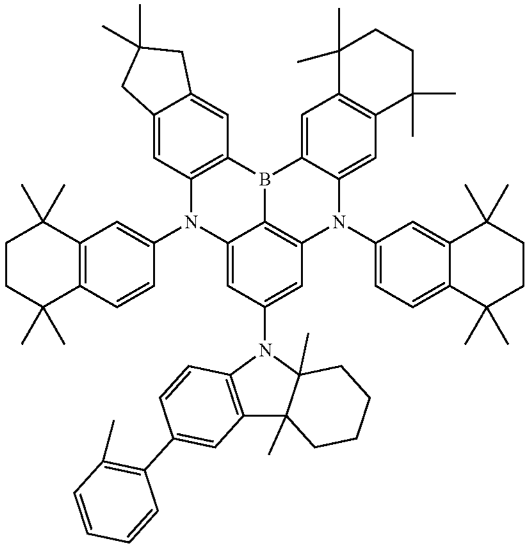

-continued
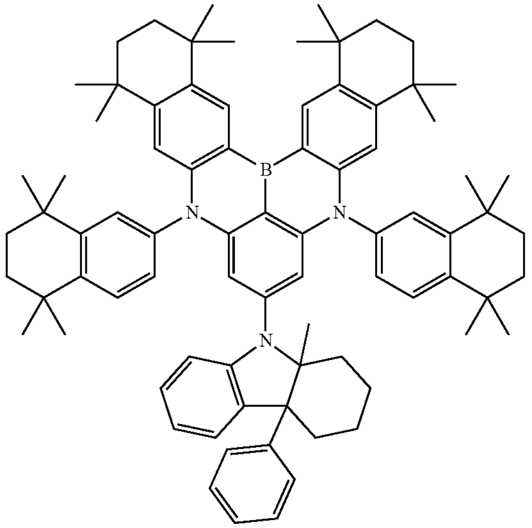
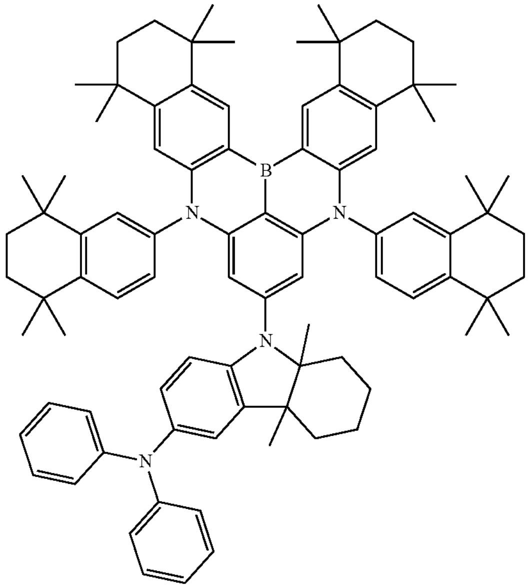
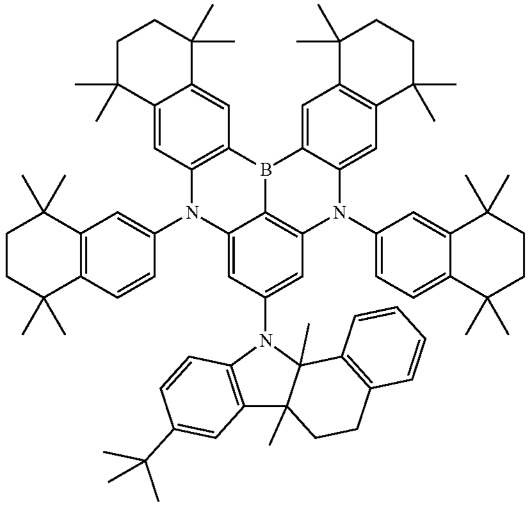
-continued
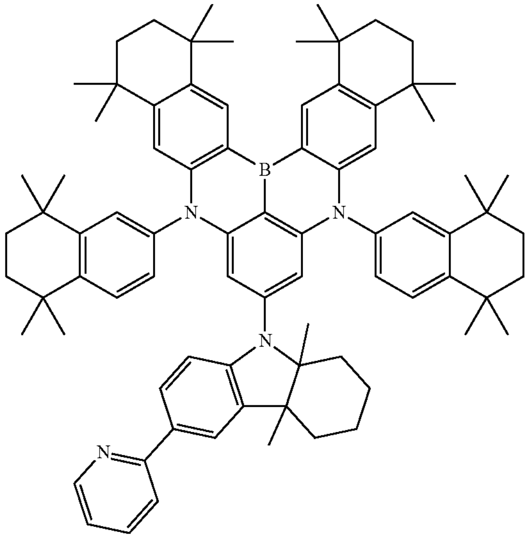
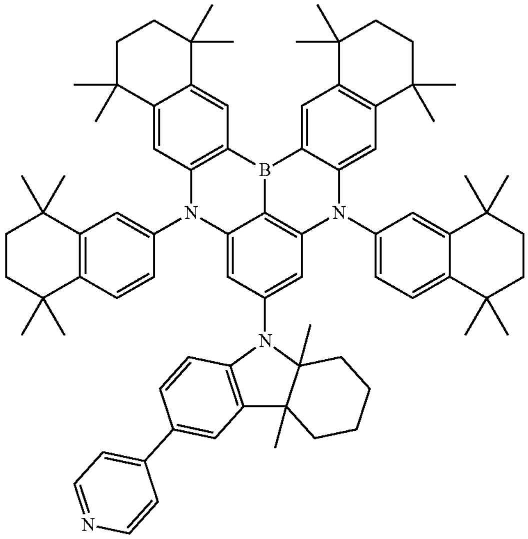
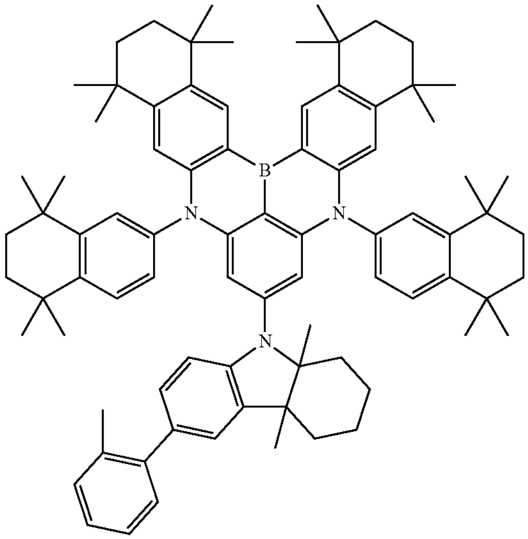

-continued
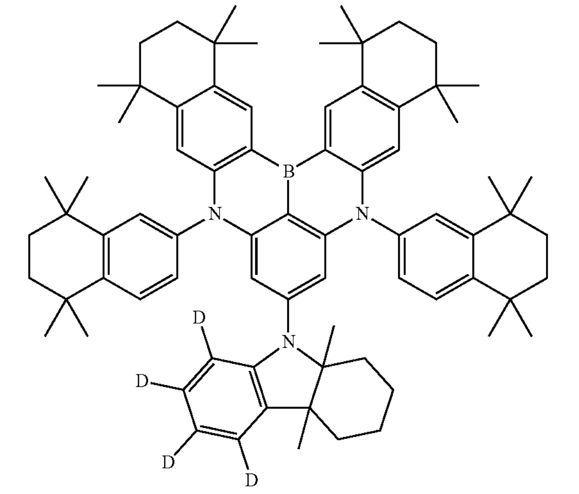
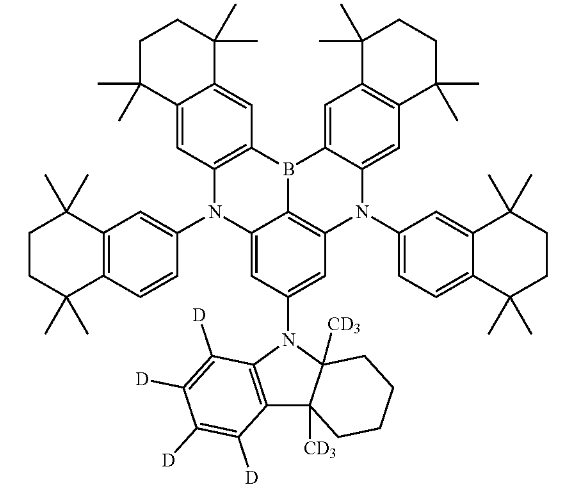
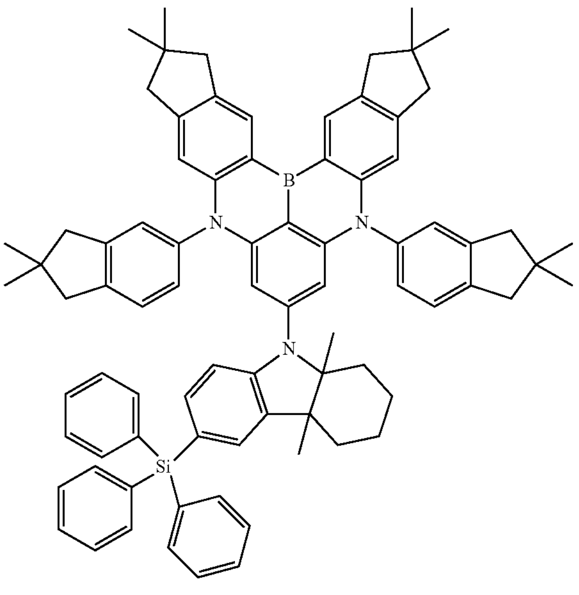
-continued
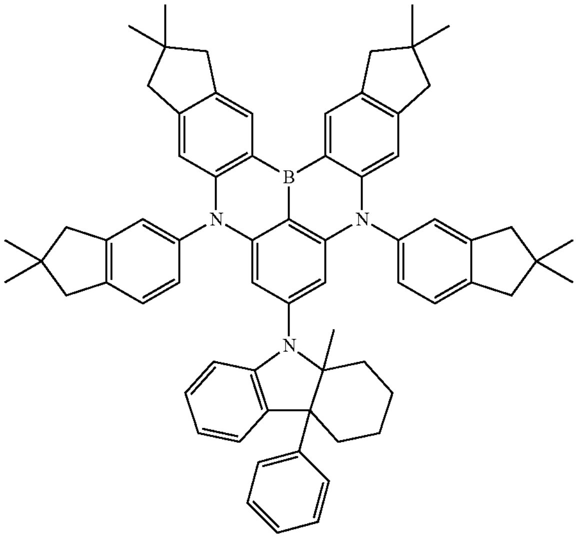
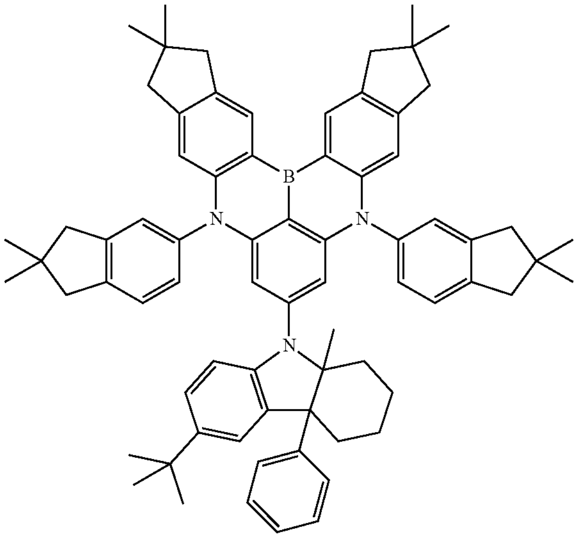
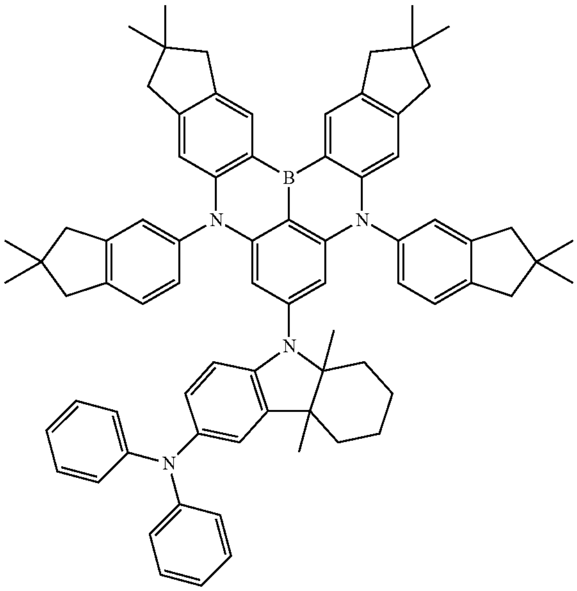

-continued
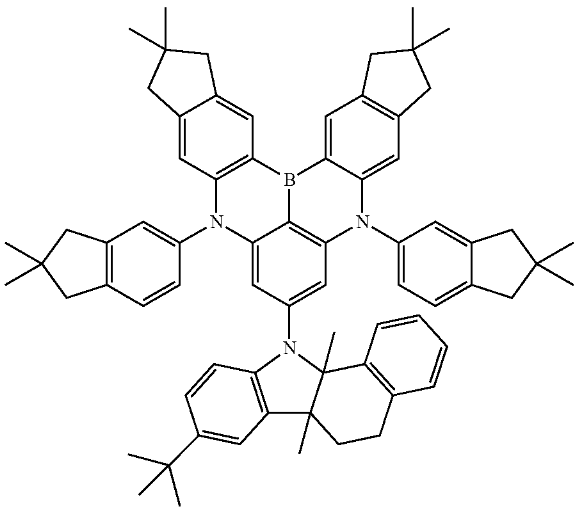
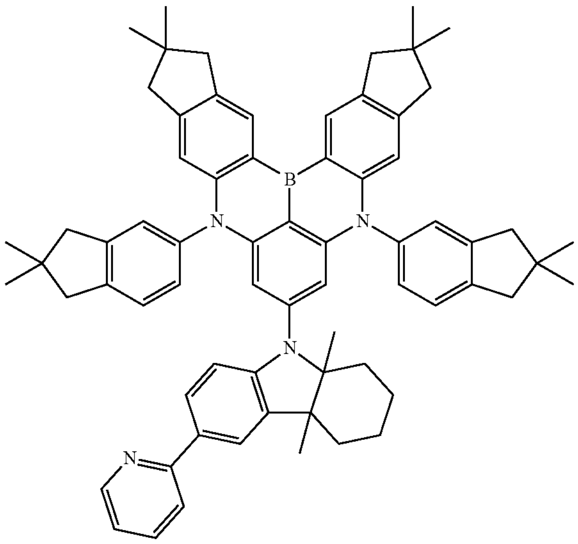
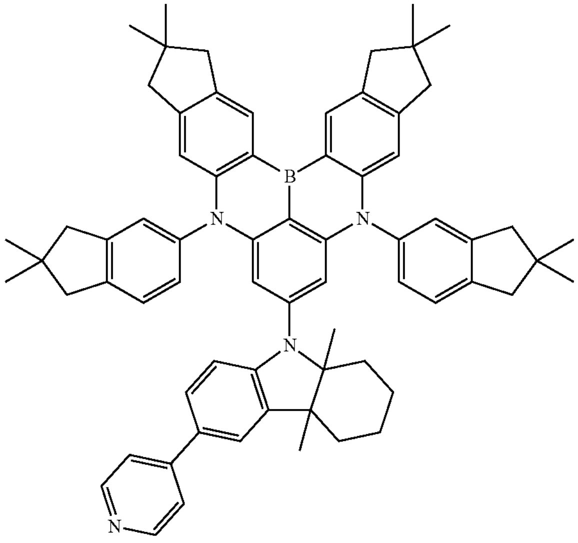
-continued
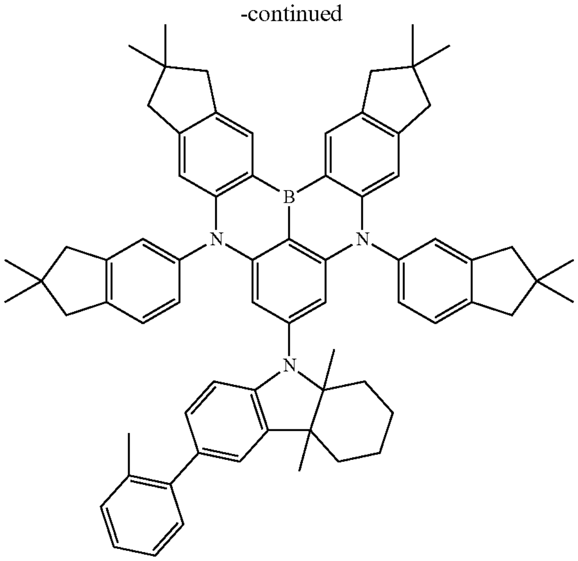
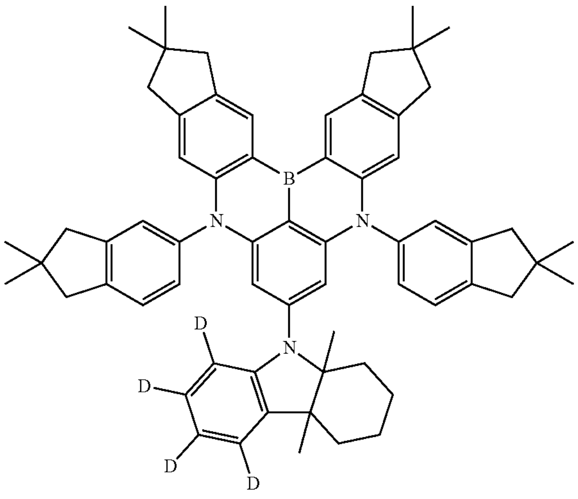
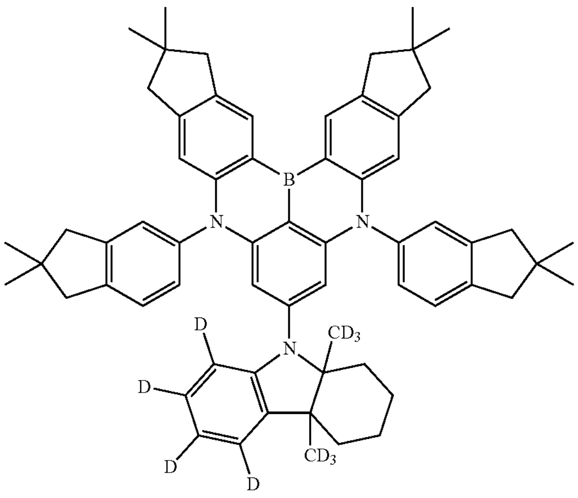

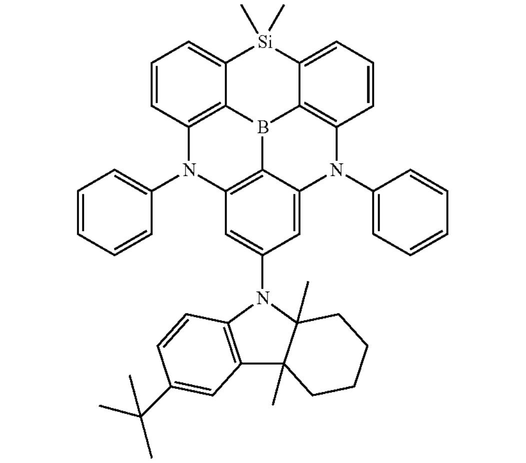
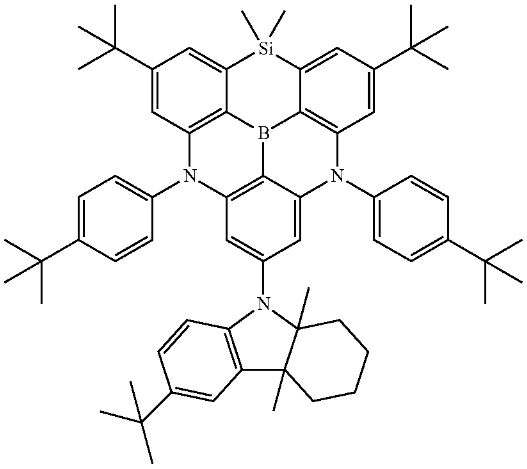
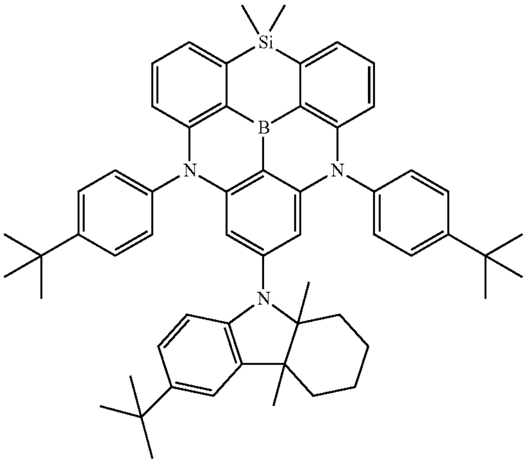
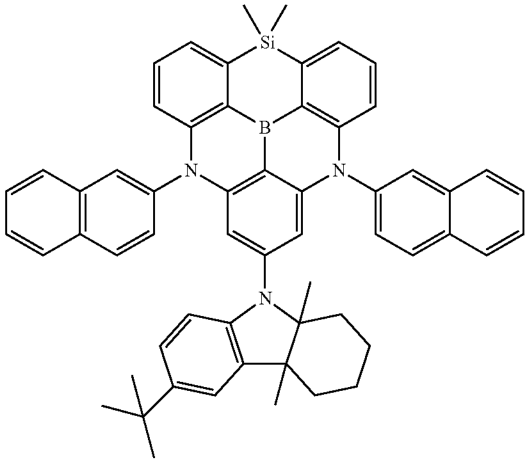
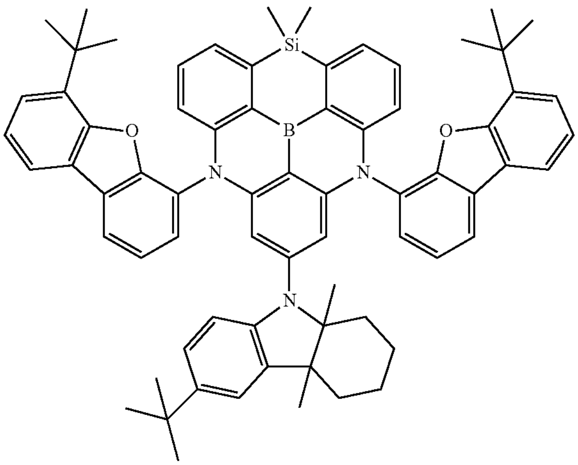
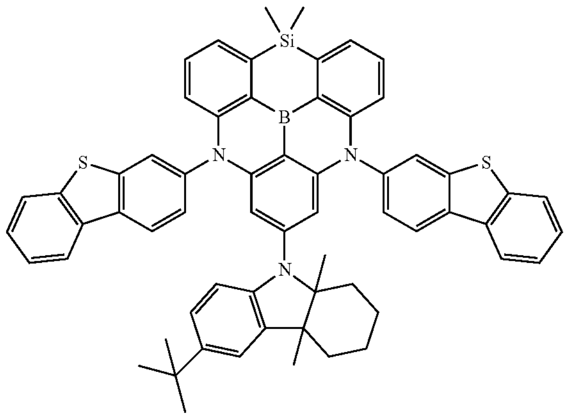

-continued
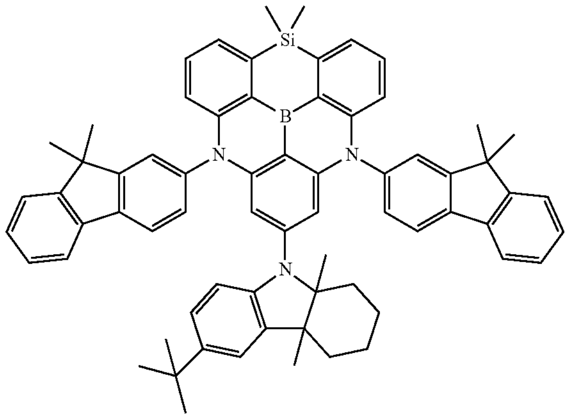
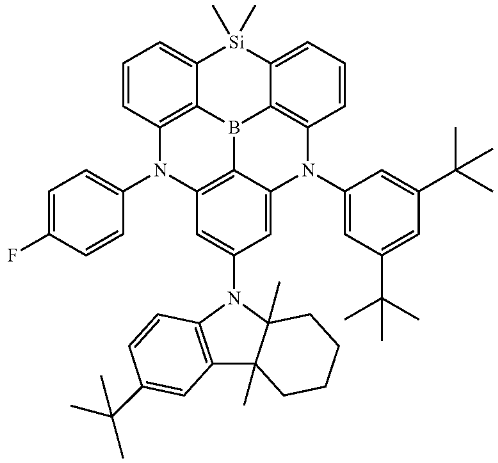
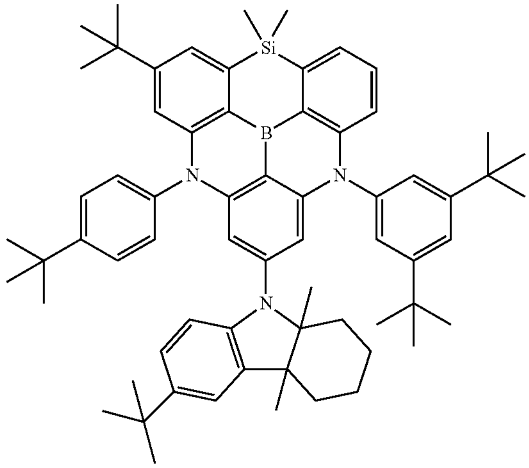
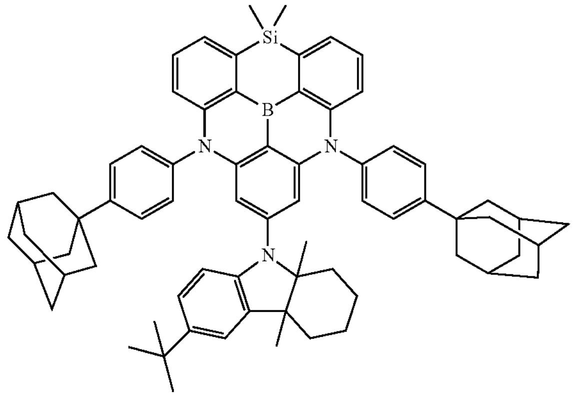
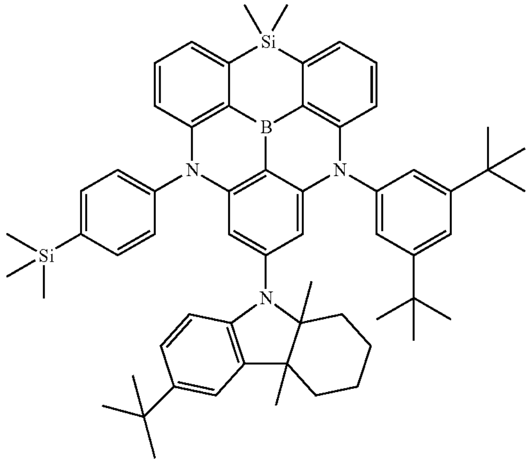
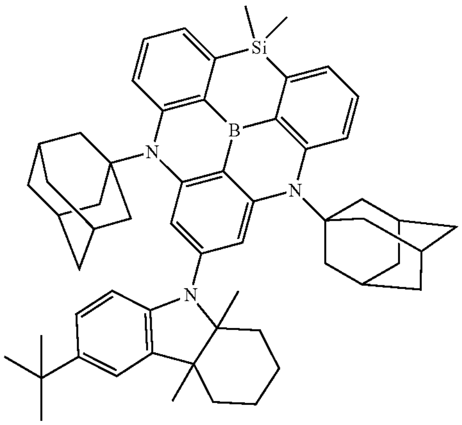
-continued -continued
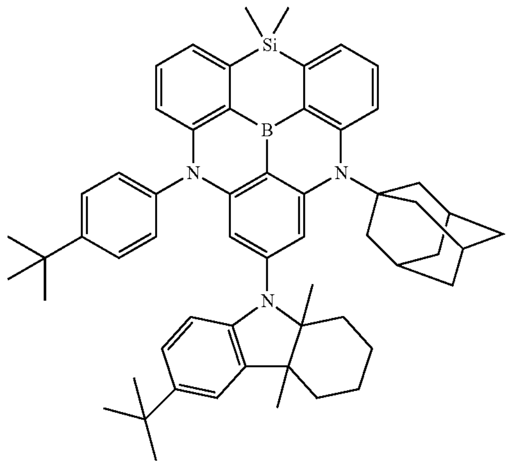
-continued
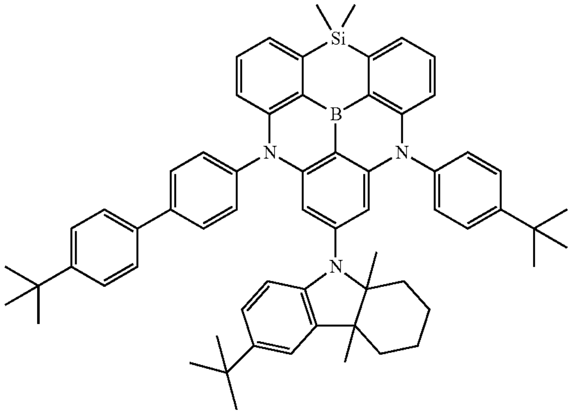
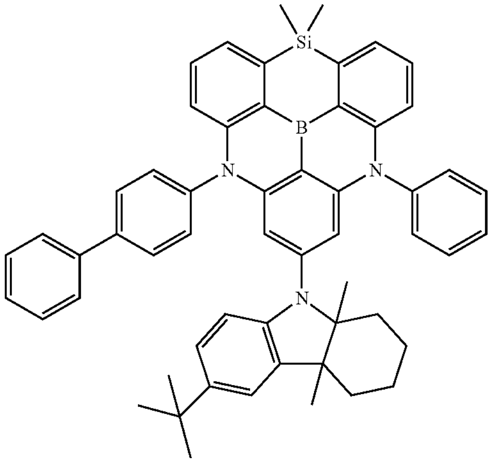
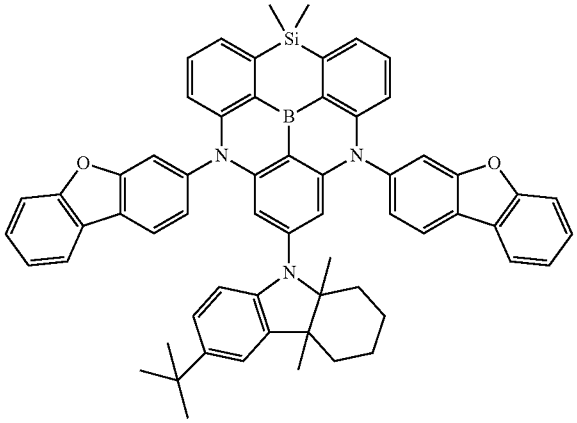
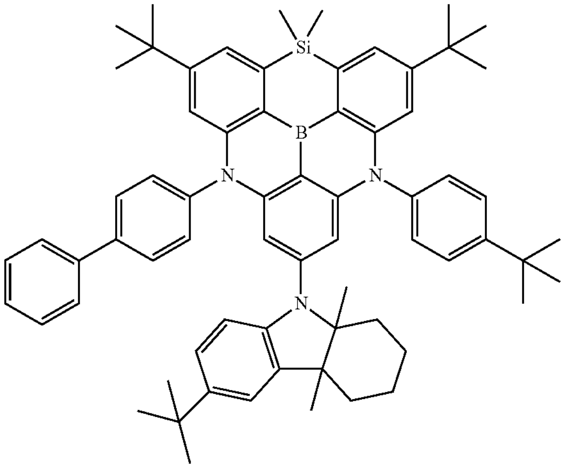
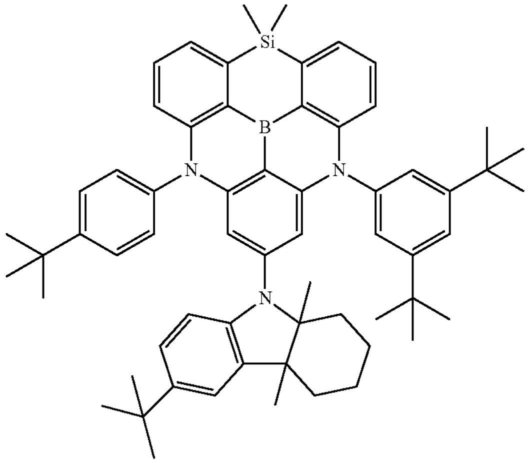

-continued
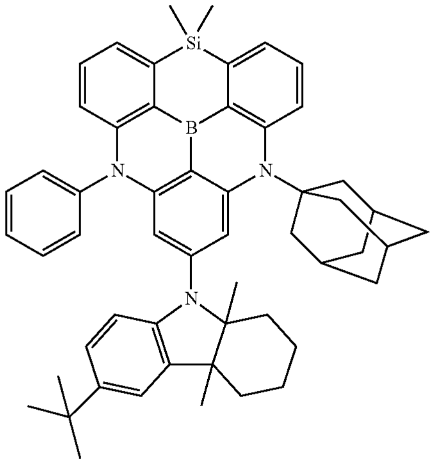
-continued
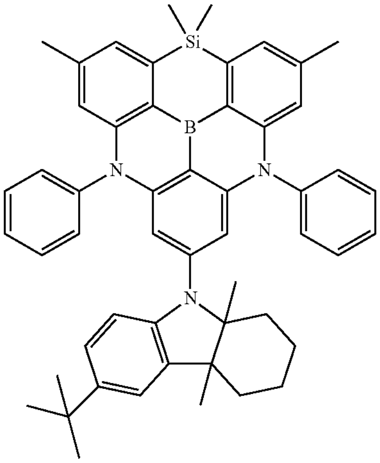
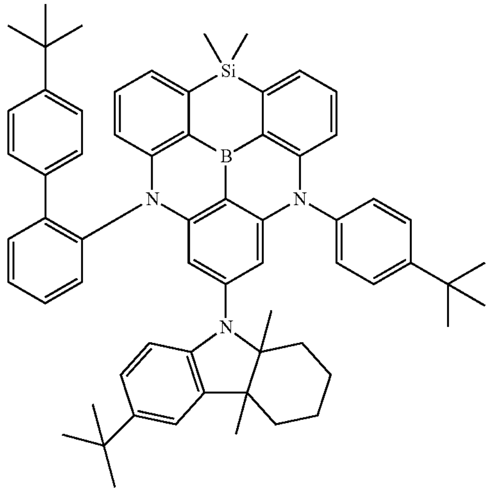
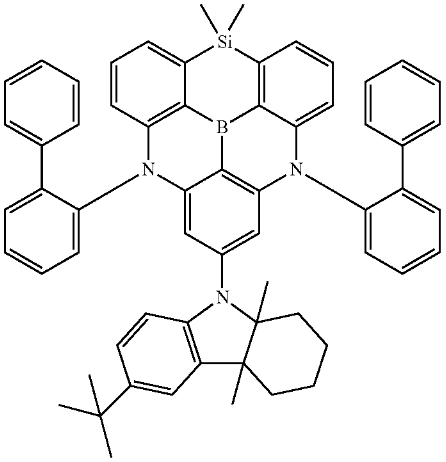
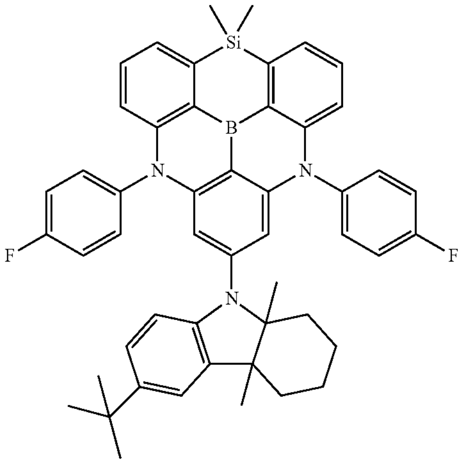
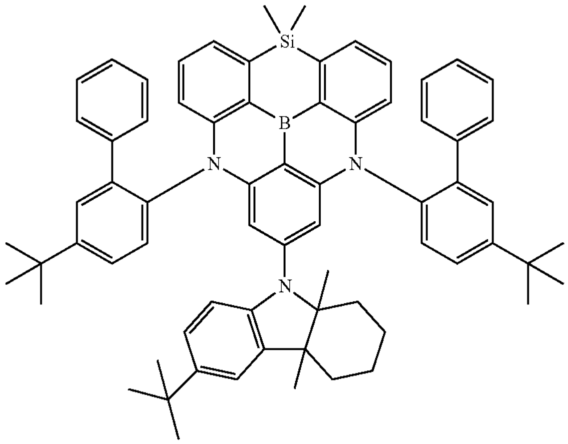

-continued
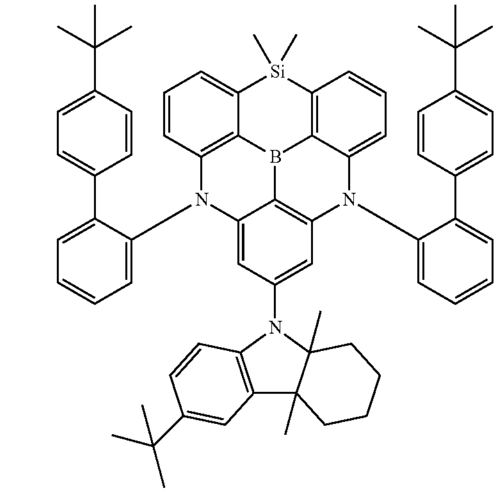
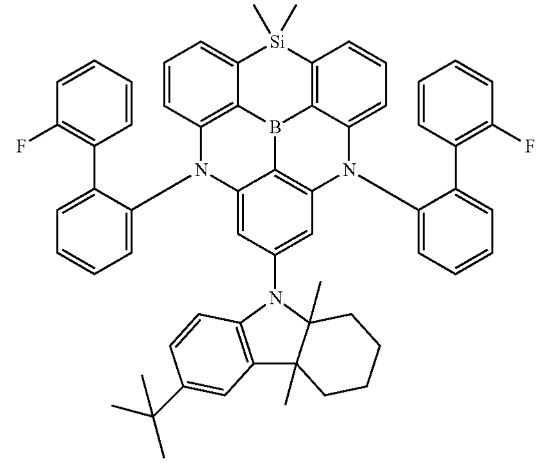
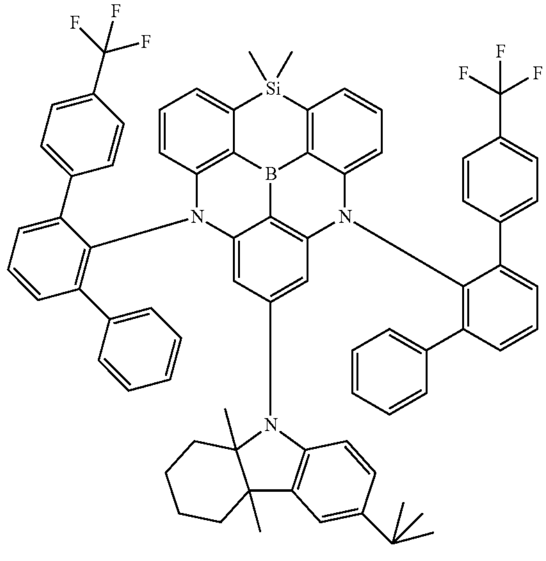
-continued
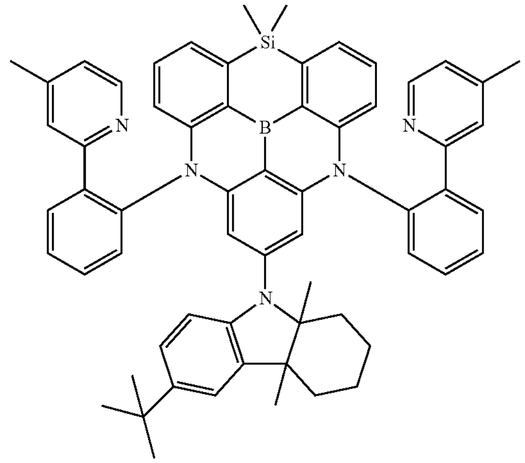
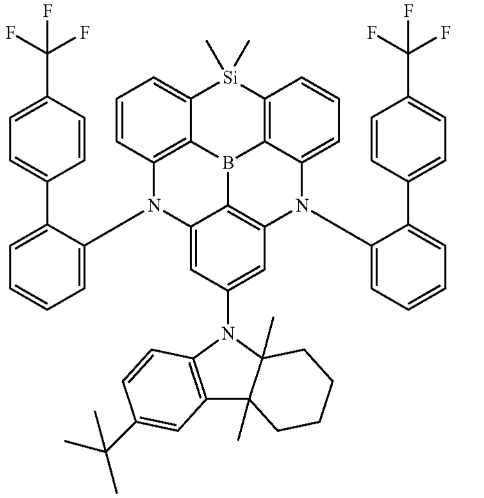
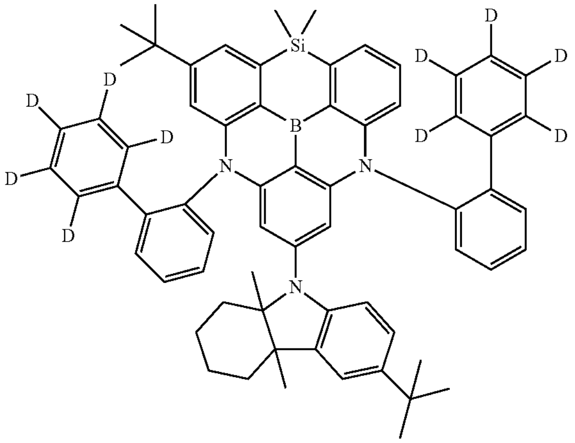

-continued
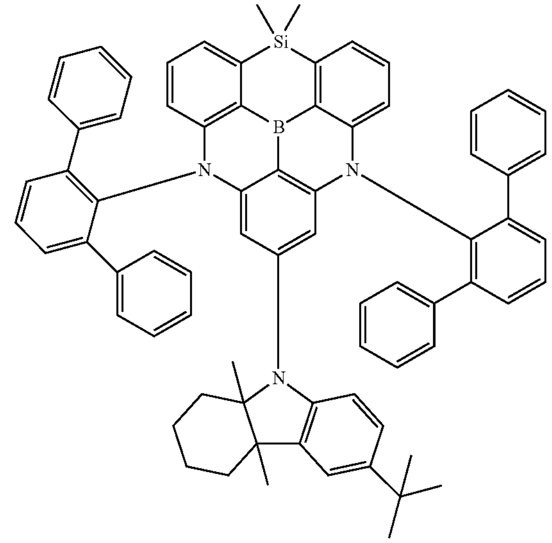
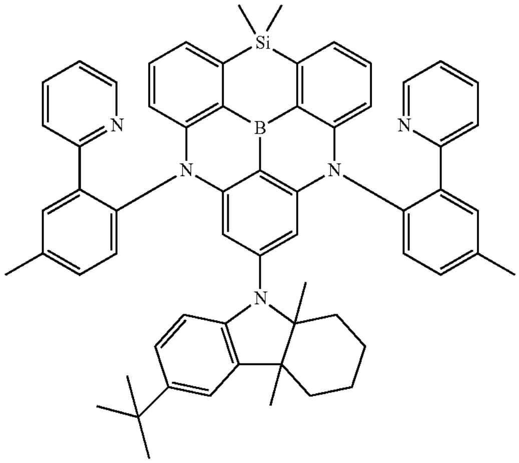
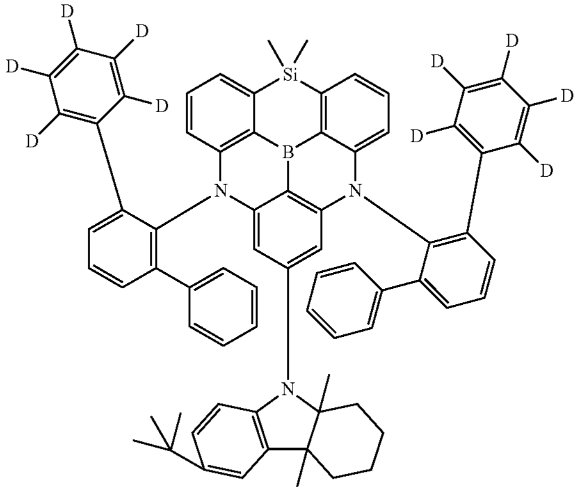
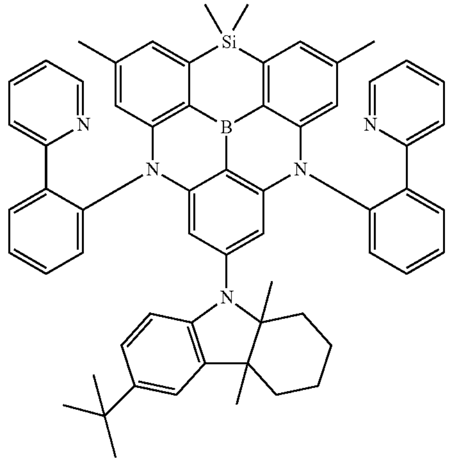
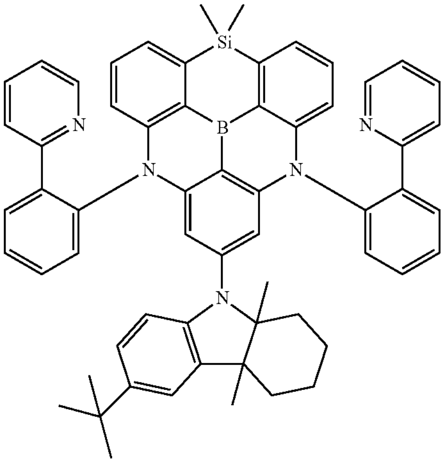
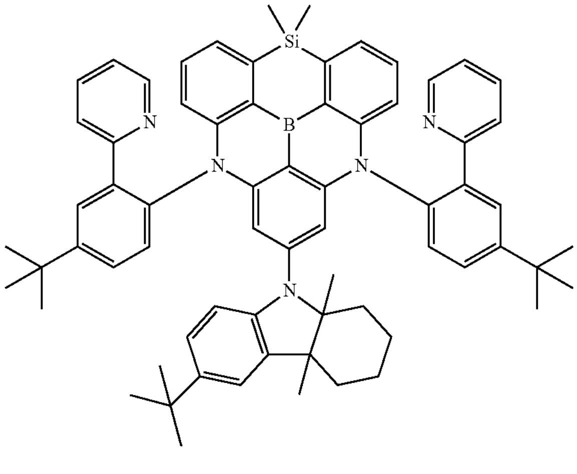

-continued
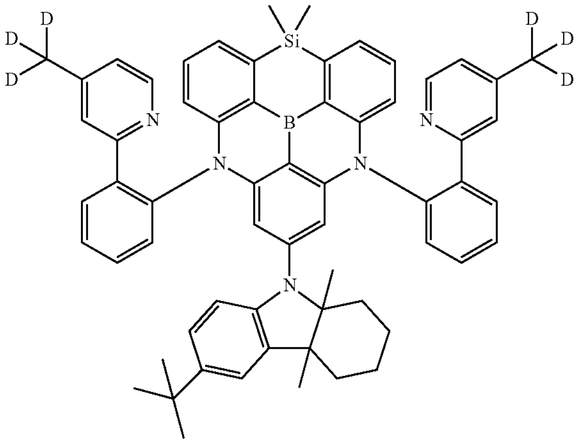
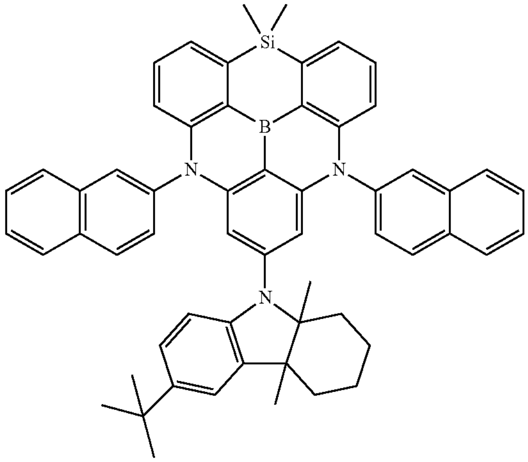
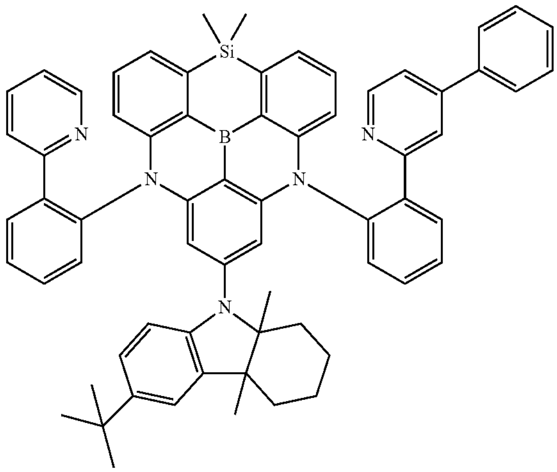
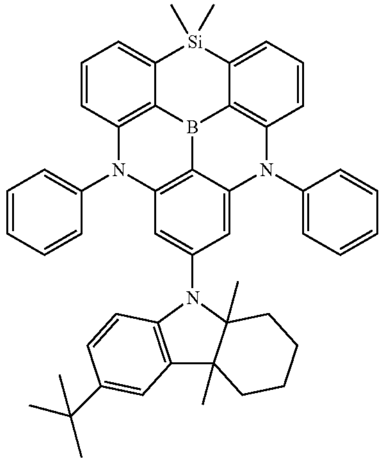
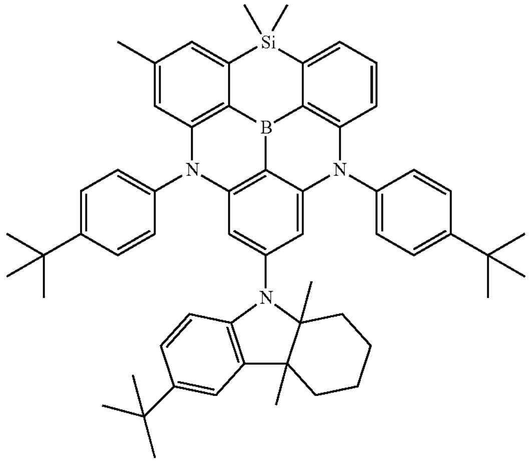
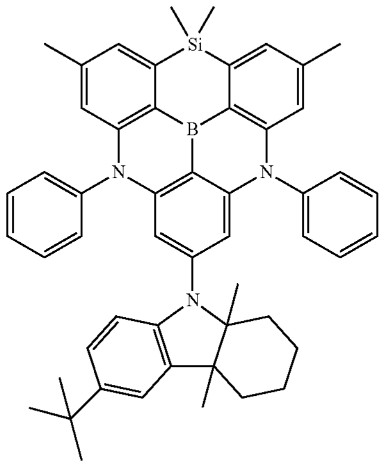

-continued
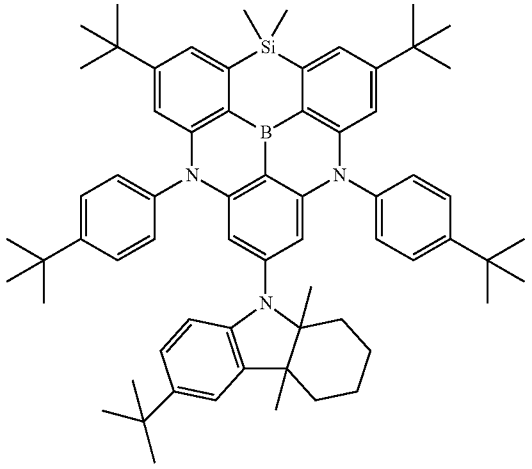
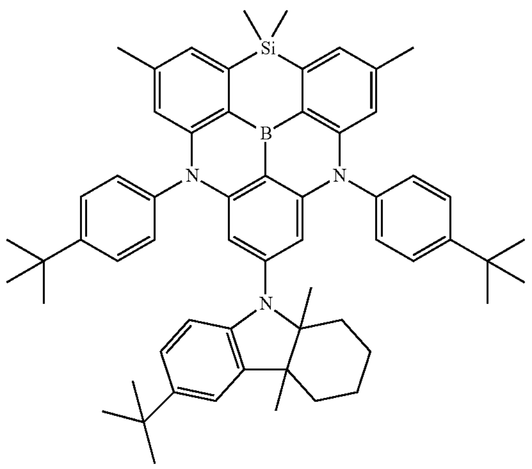
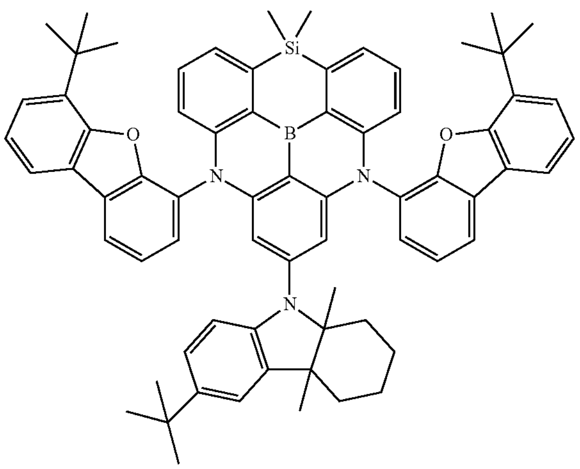
-continued
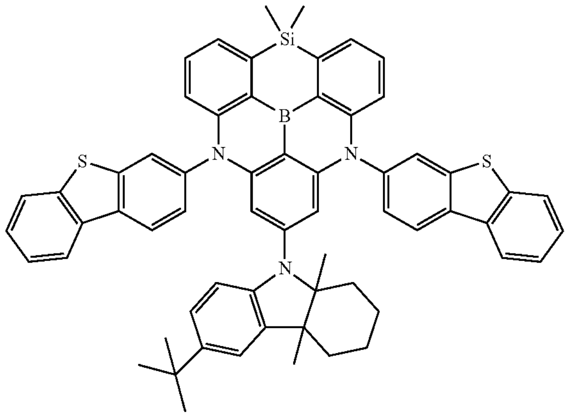
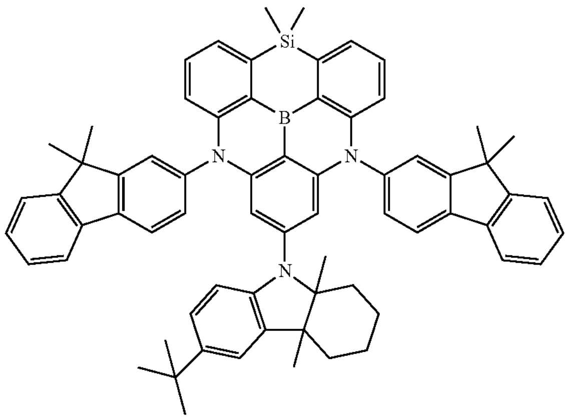
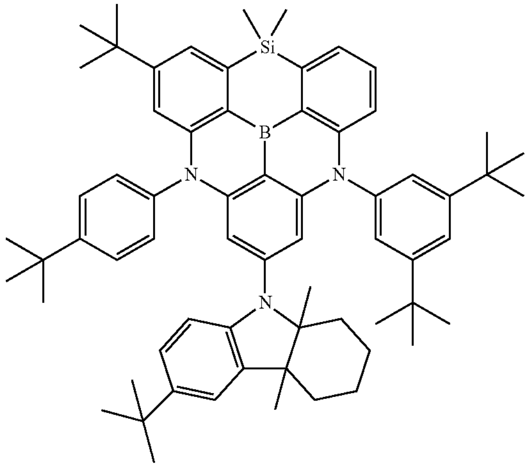

-continued
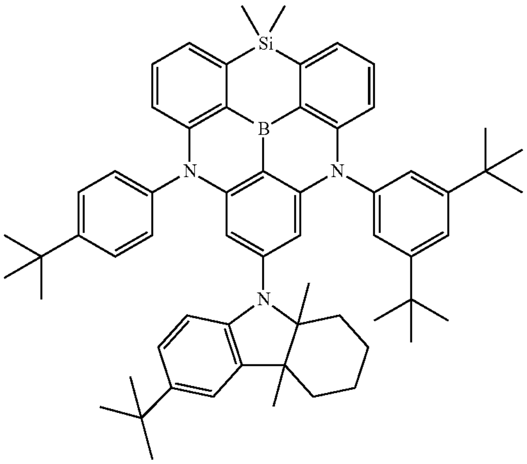
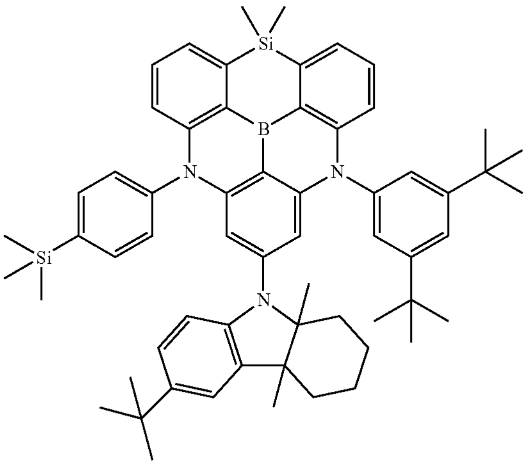
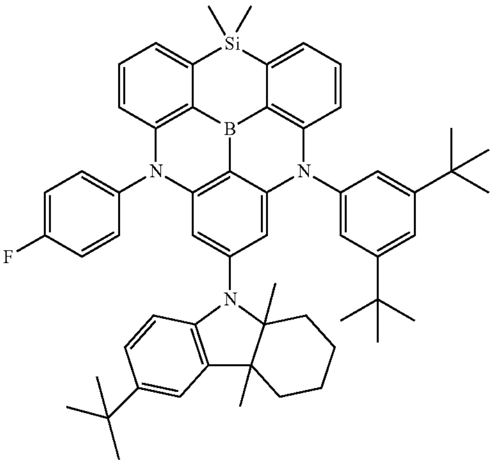
-continued
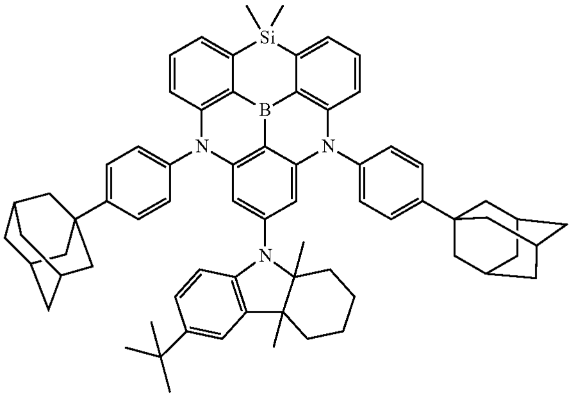
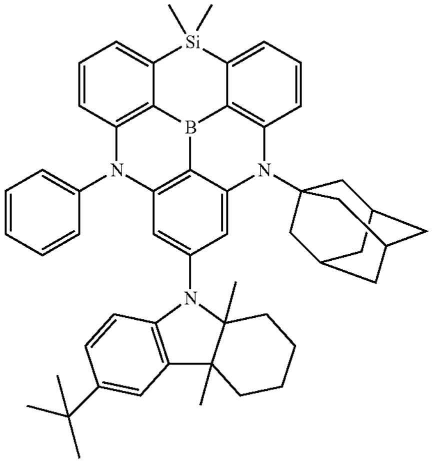
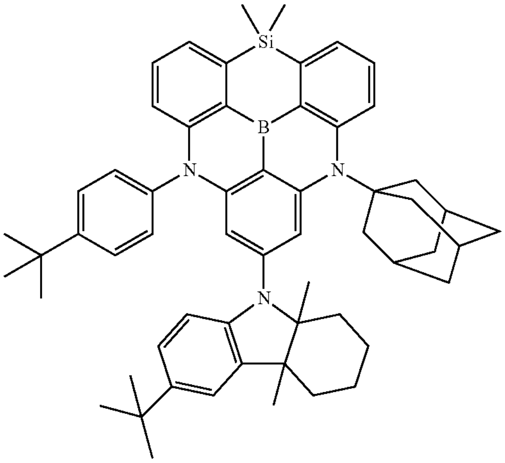

-continued
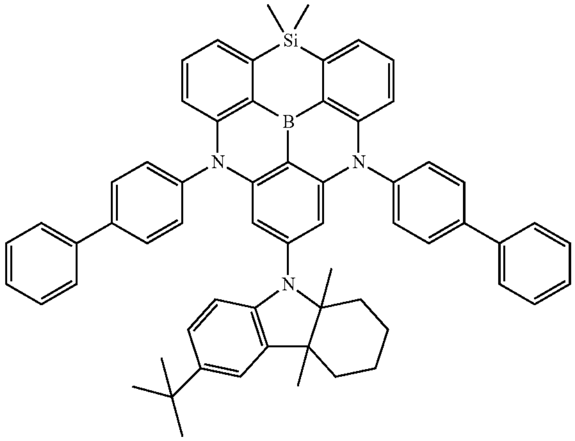
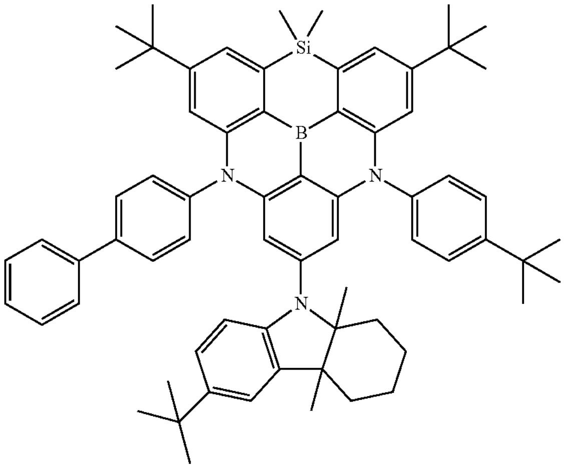
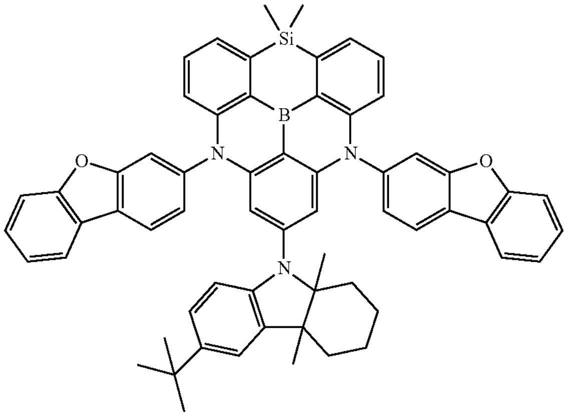
-continued
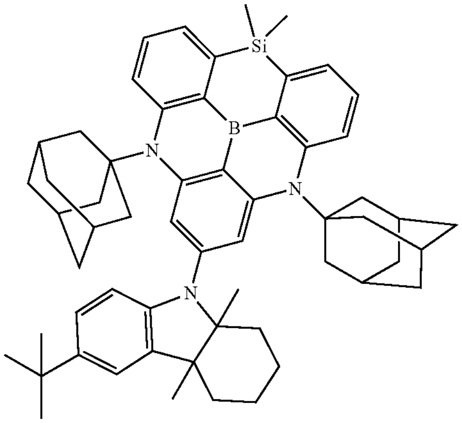
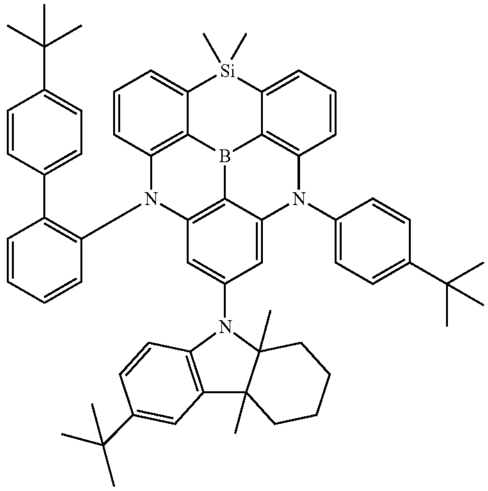
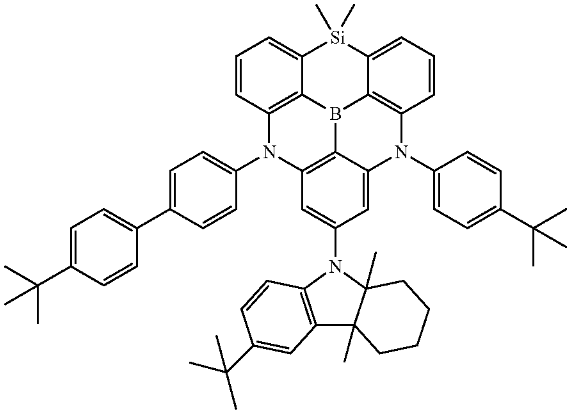

-continued
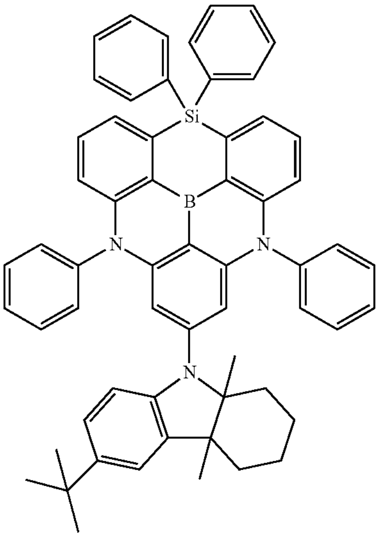
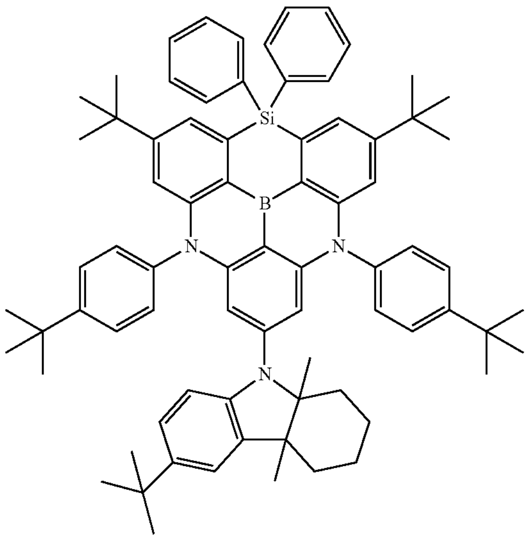
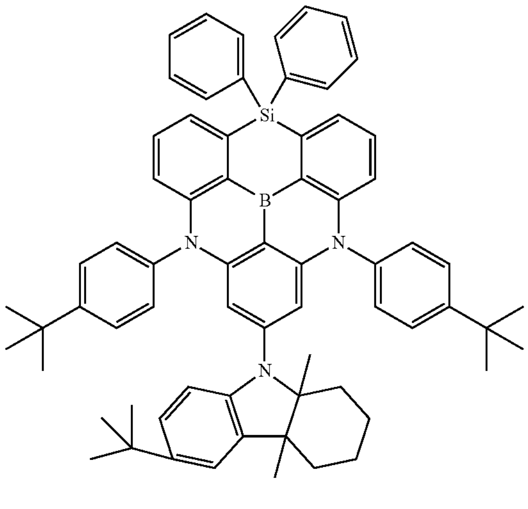
-continued
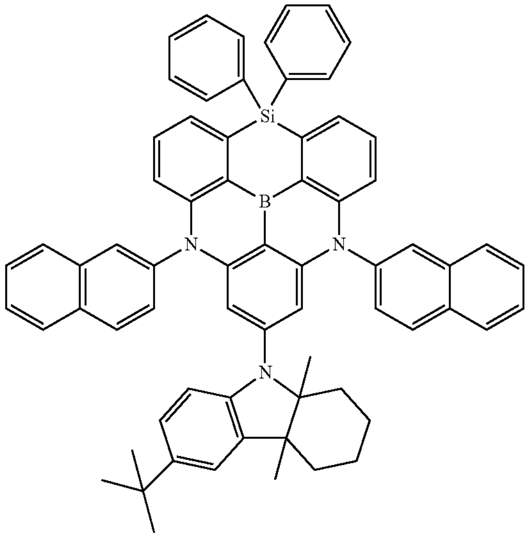
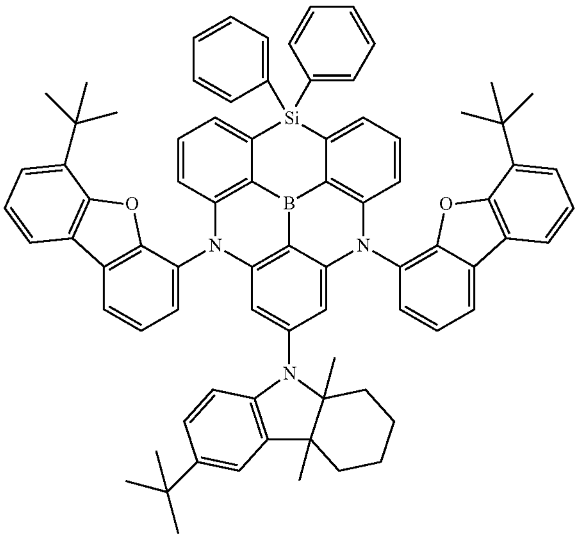
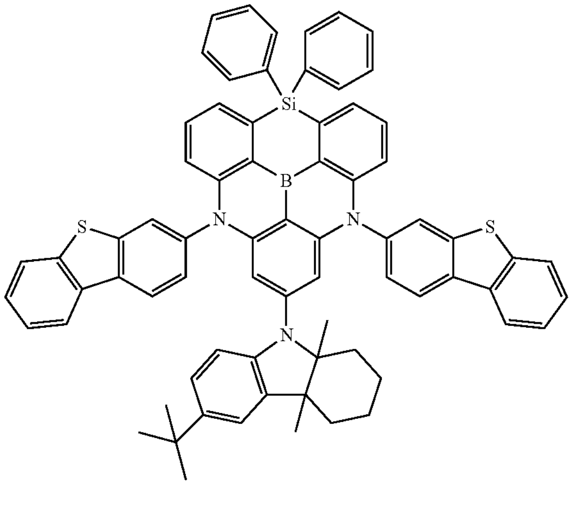

-continued
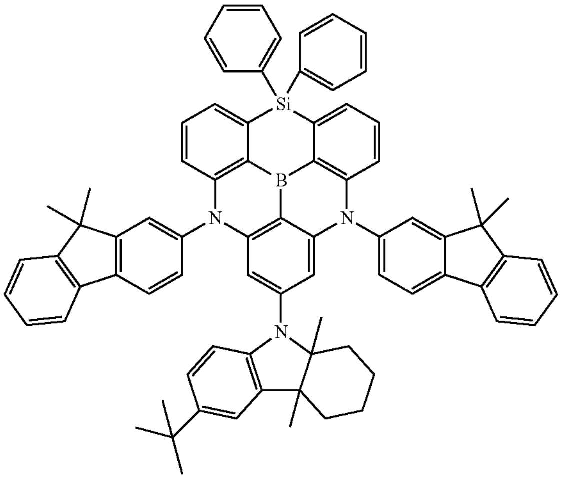
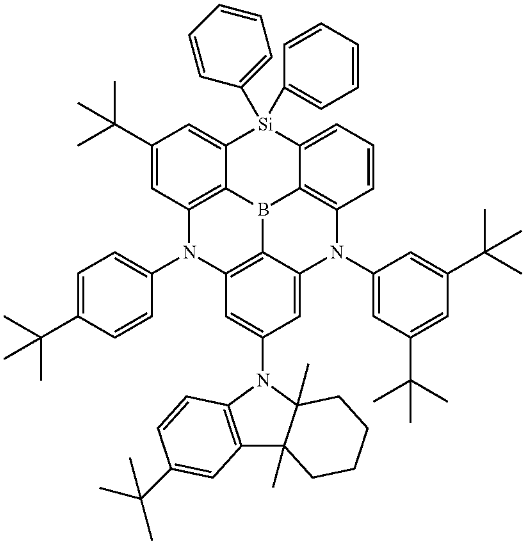
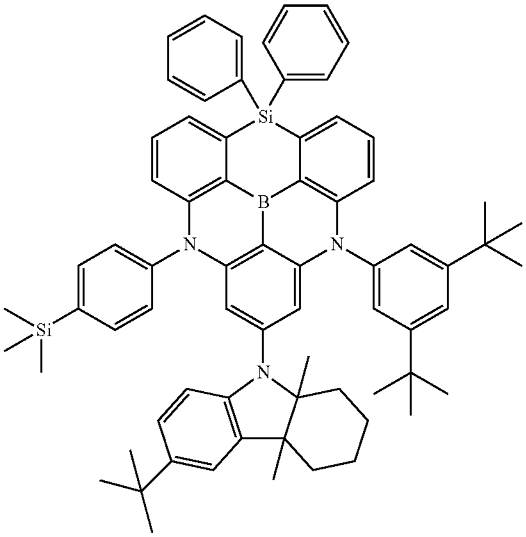
-continued
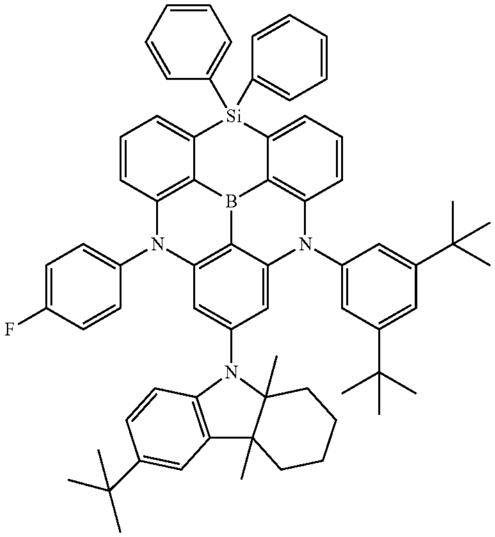
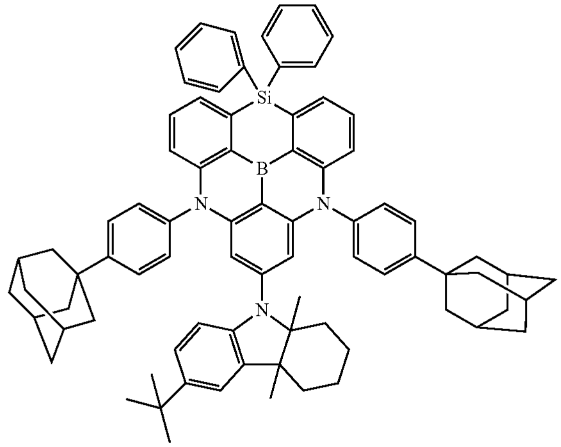
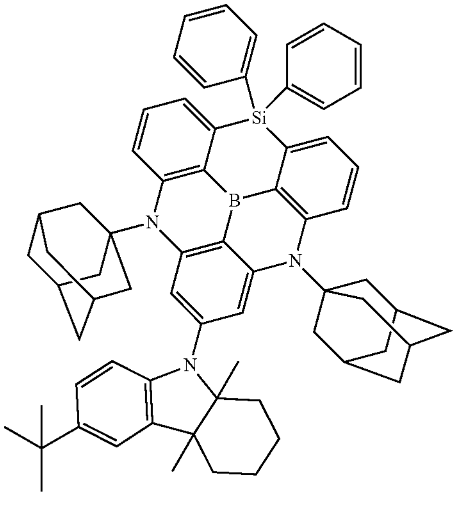

-continued
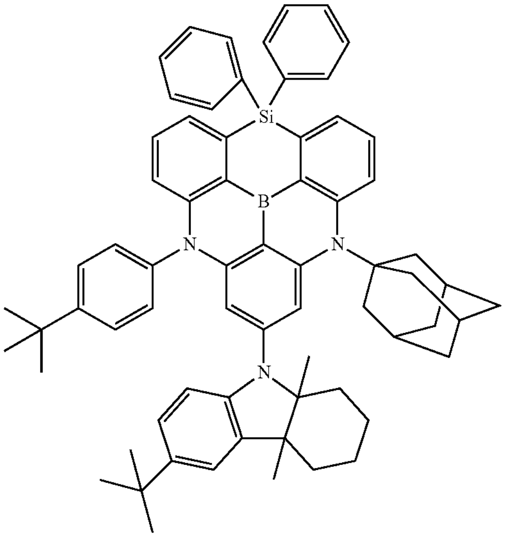
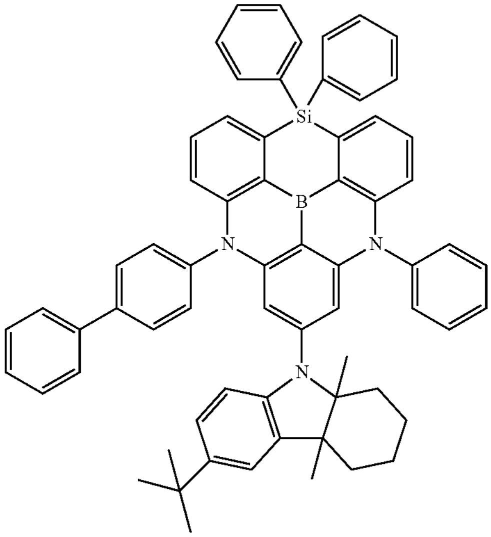
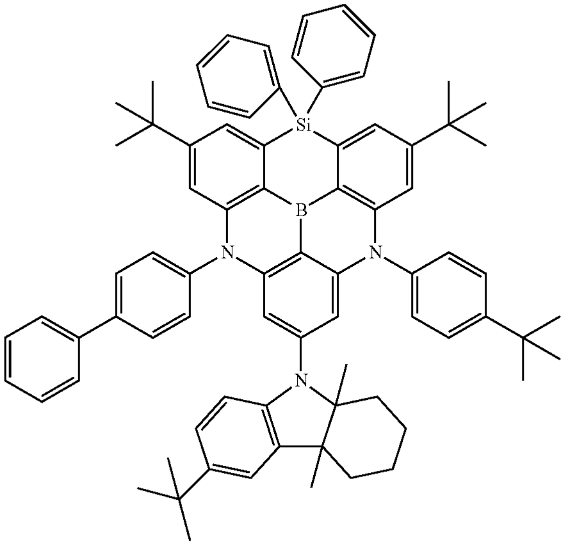
-continued
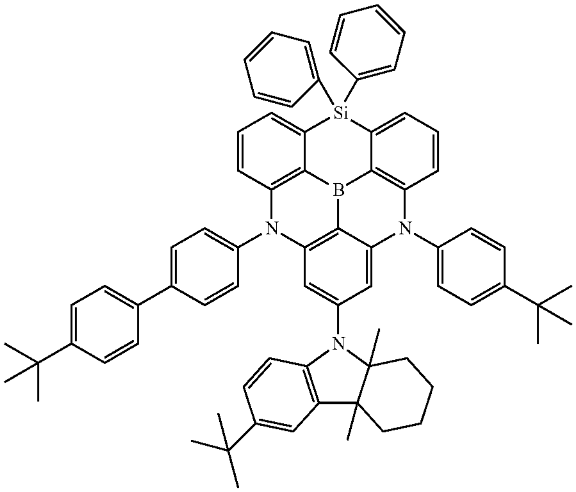
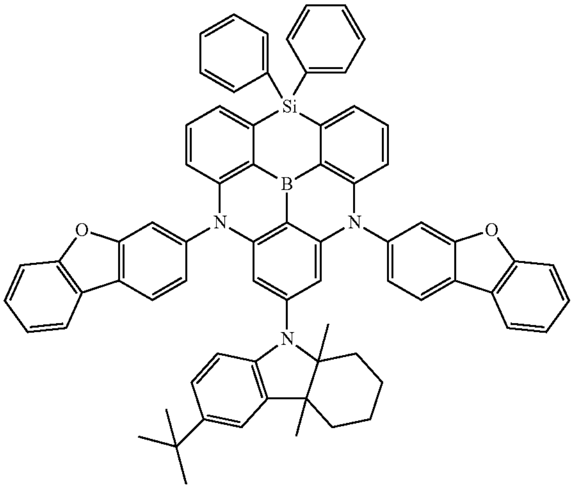
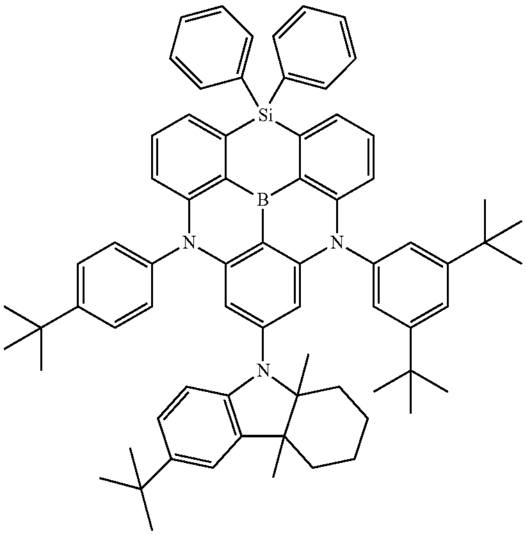

-continued
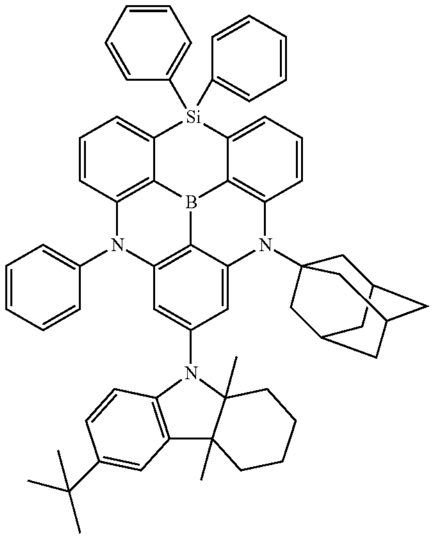
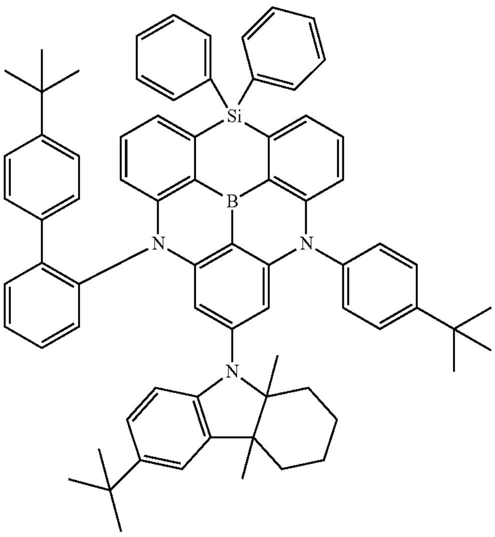
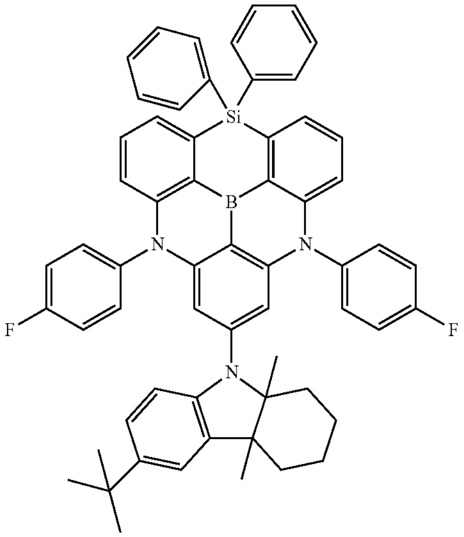
-continued
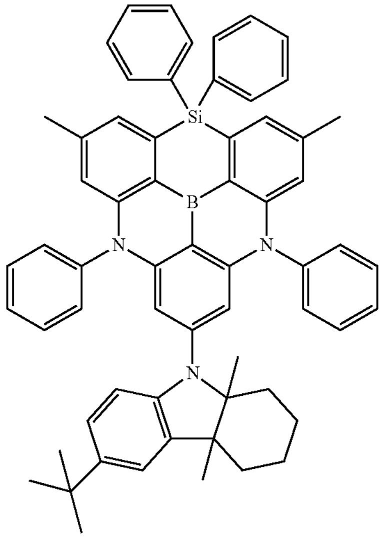
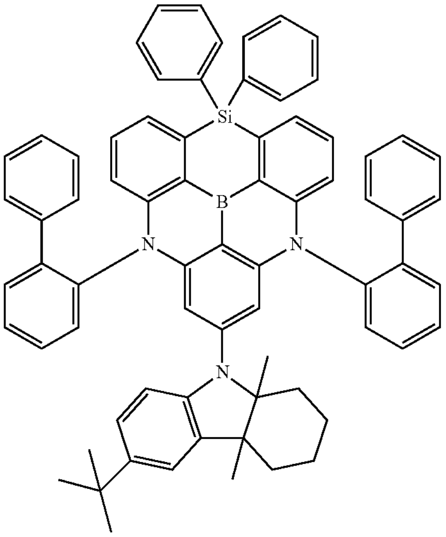
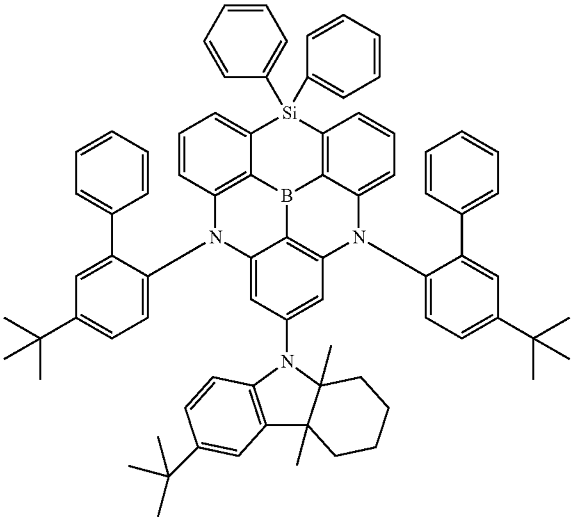

-continued
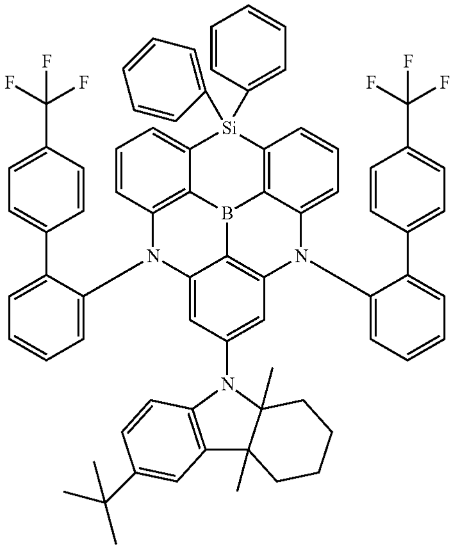
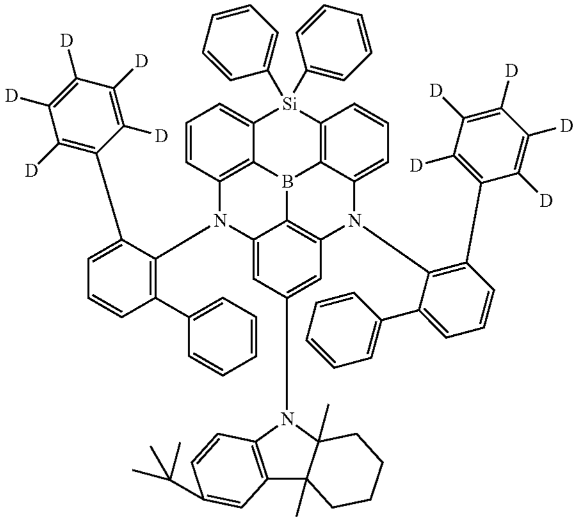
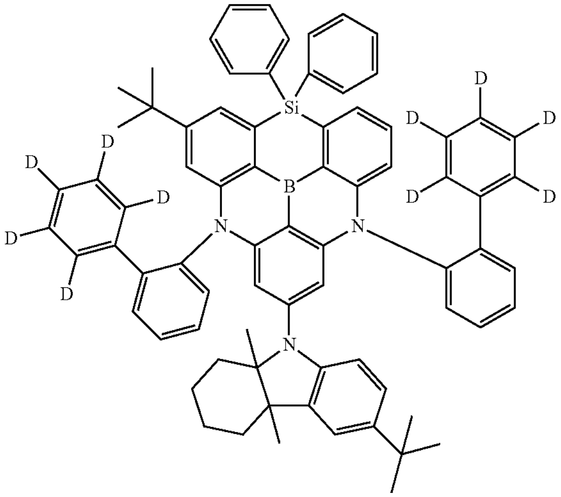
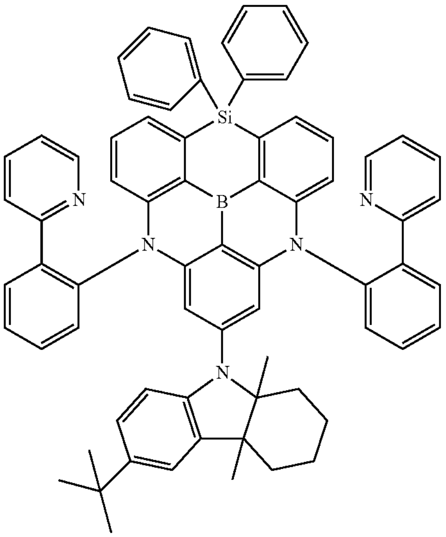
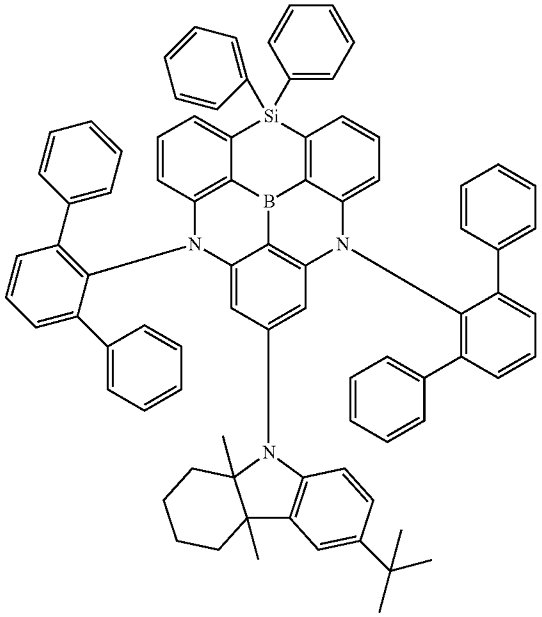
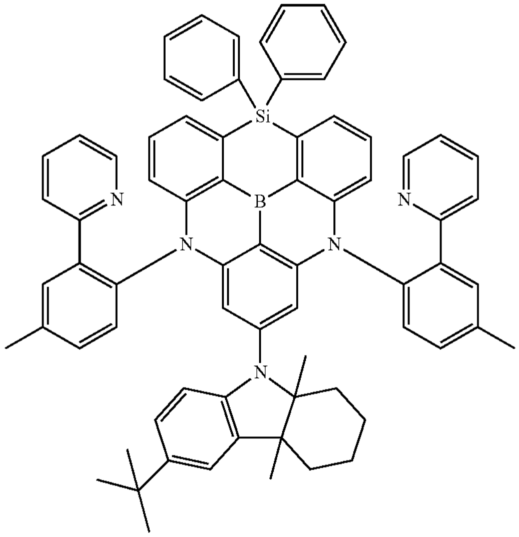
-continued -continued
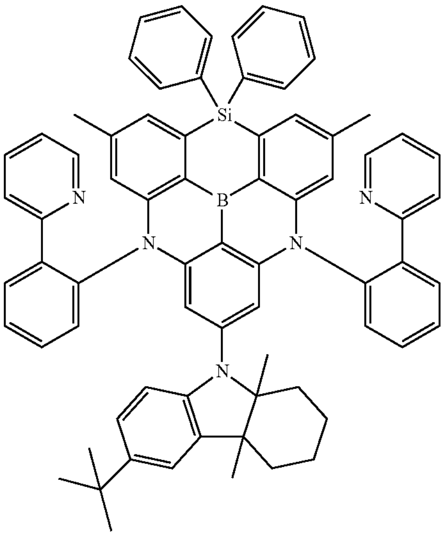
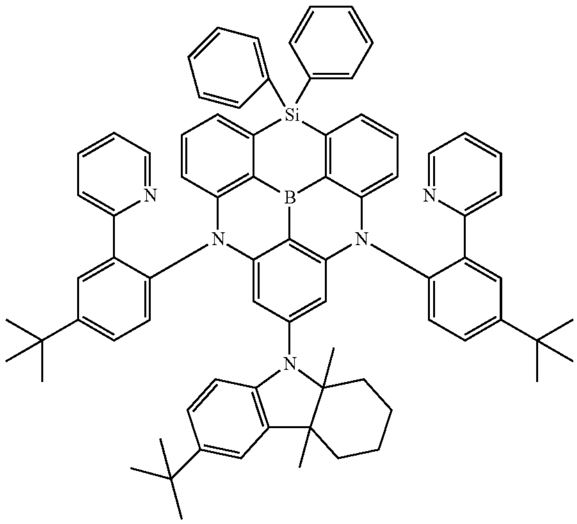
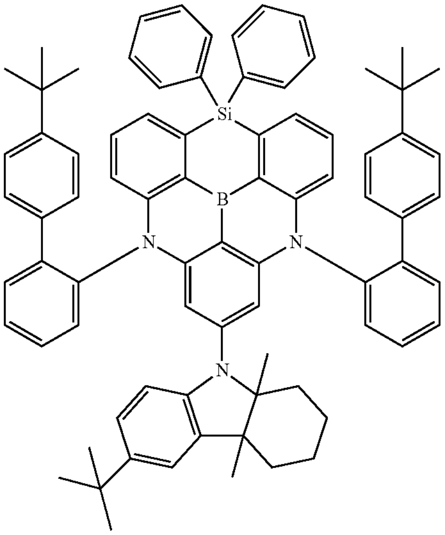
-continued
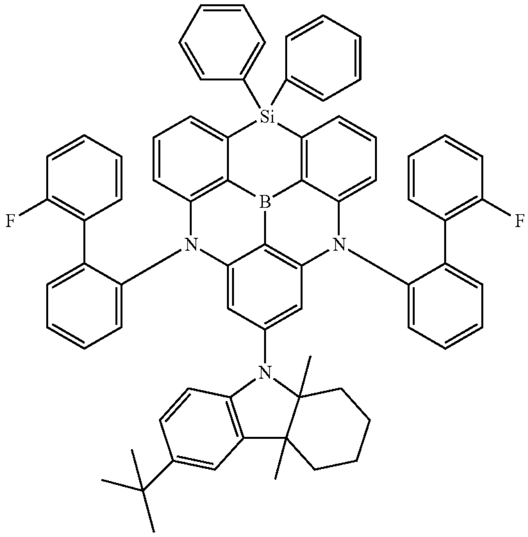
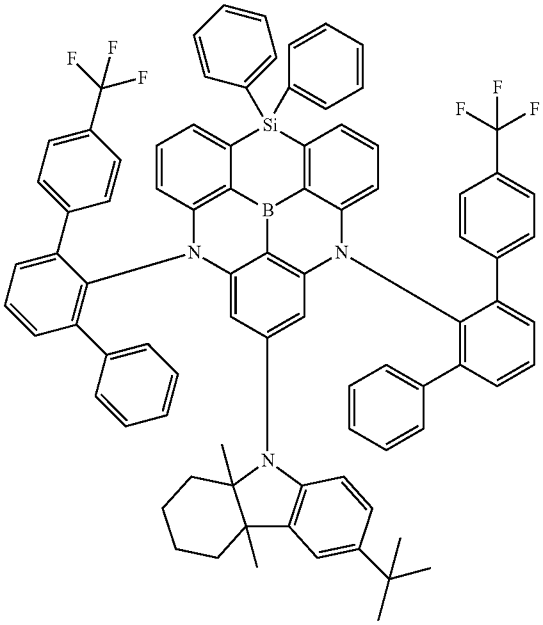
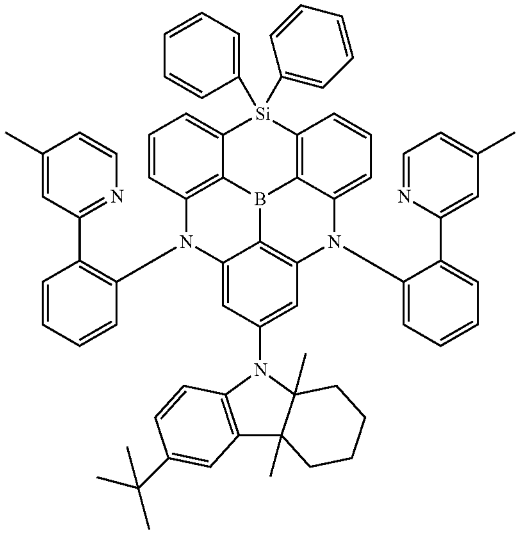

-continued
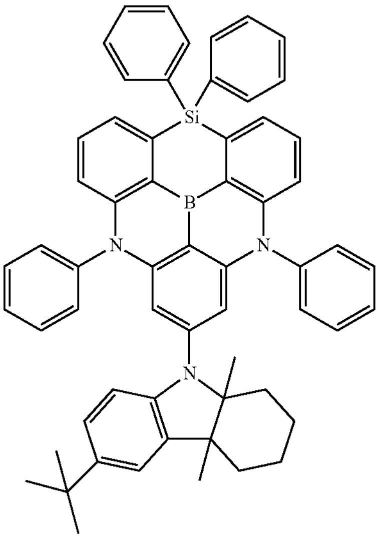
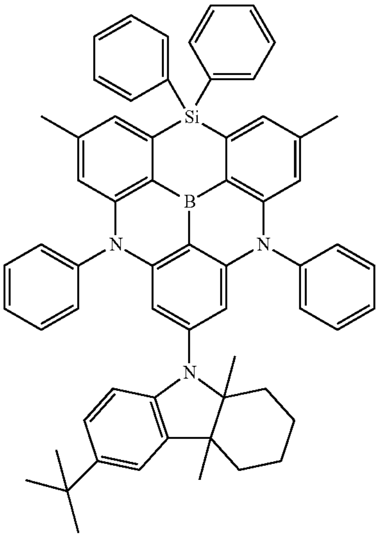
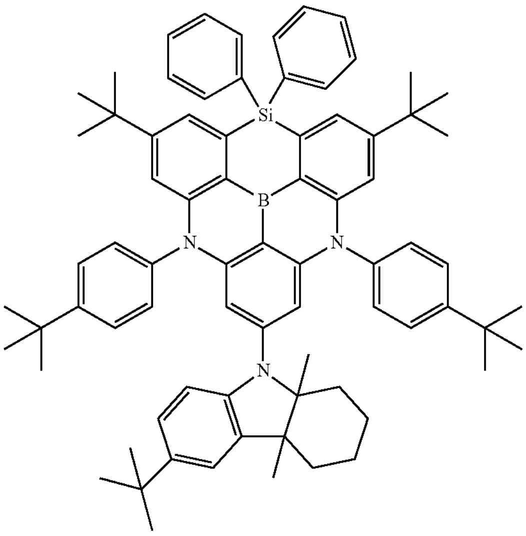
-continued
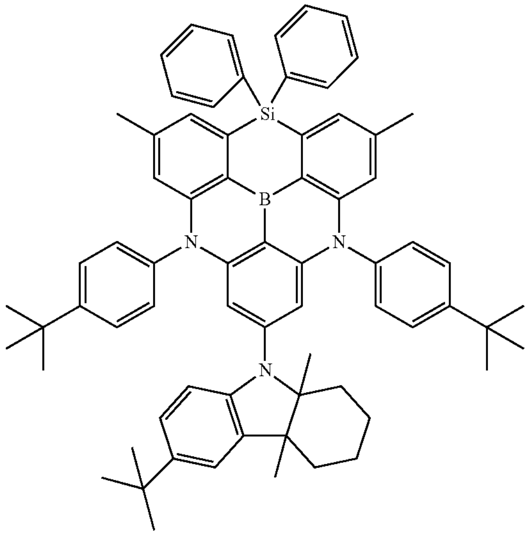
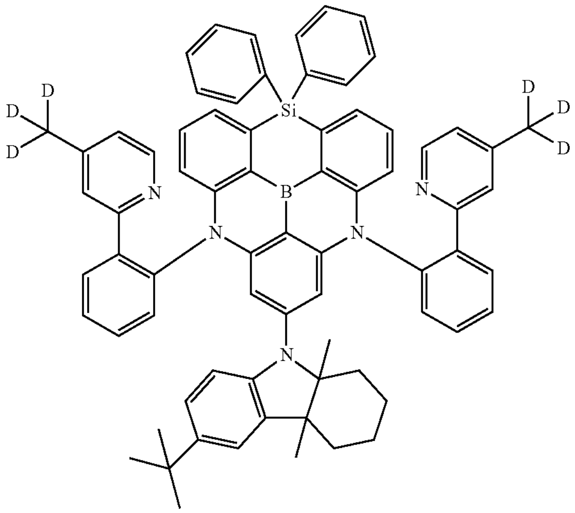
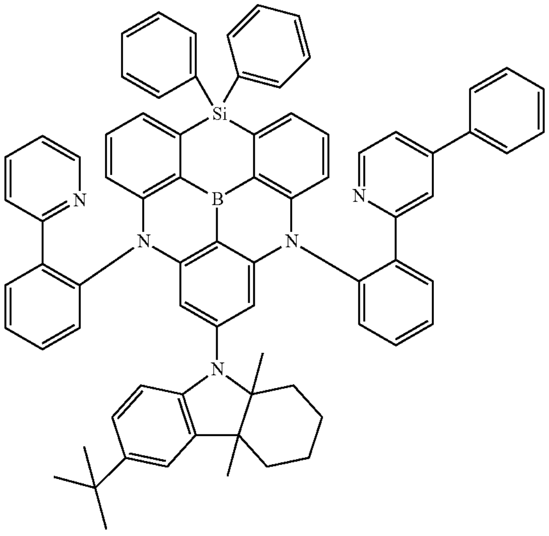

-continued
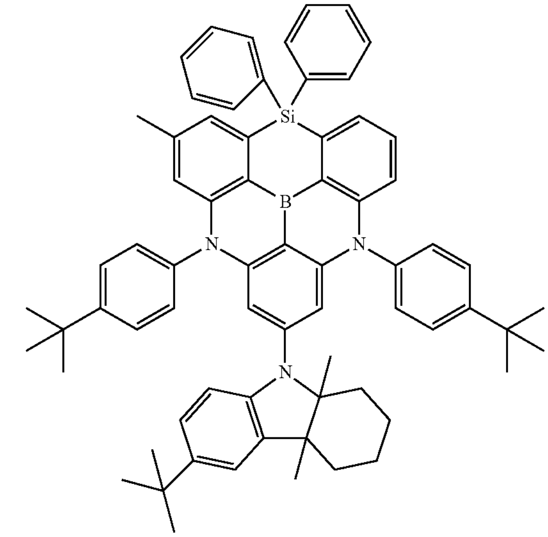
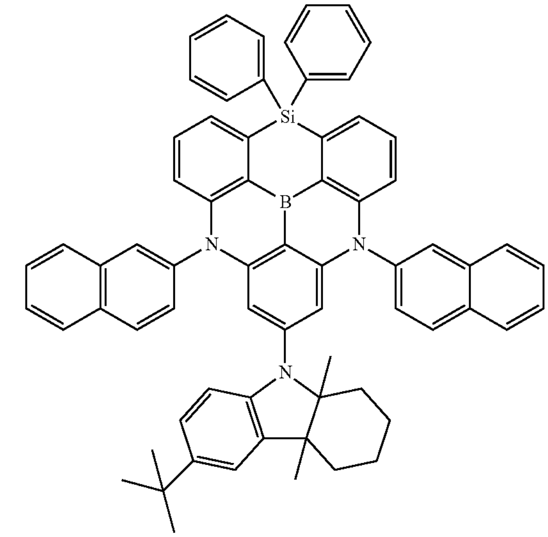
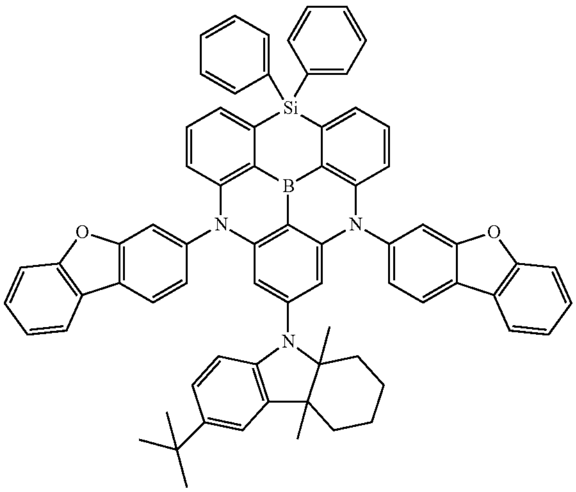
-continued
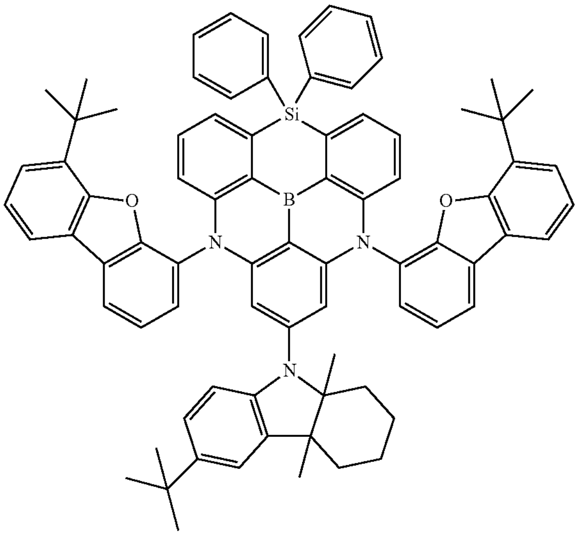
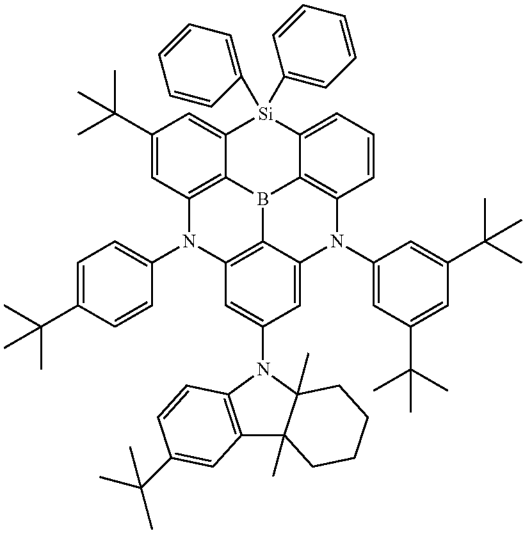
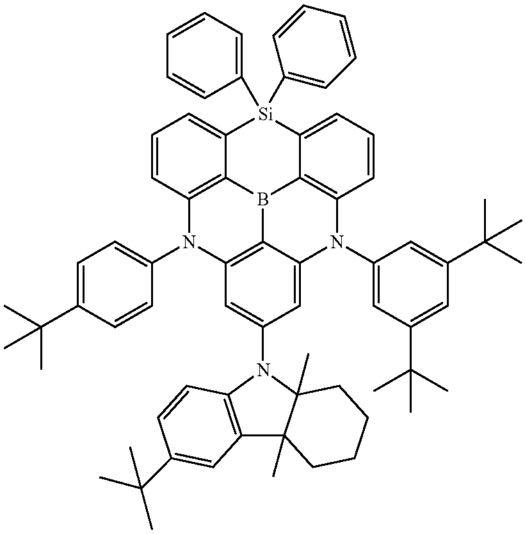

-continued
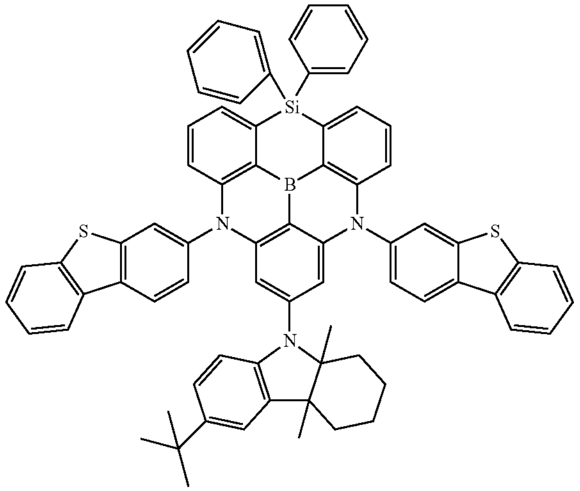
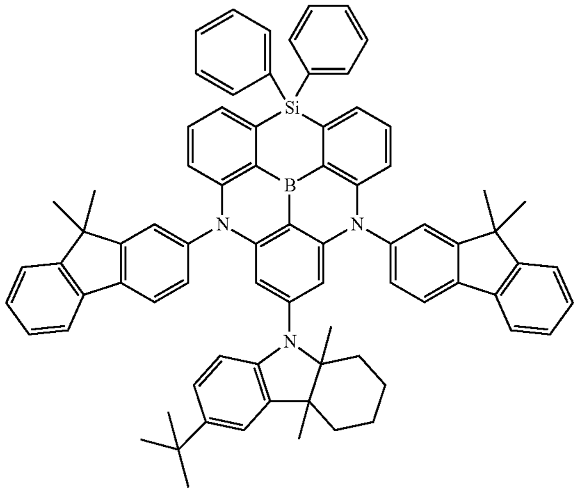
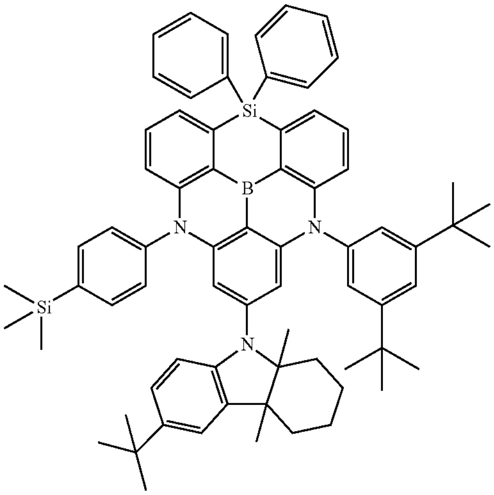
-continued
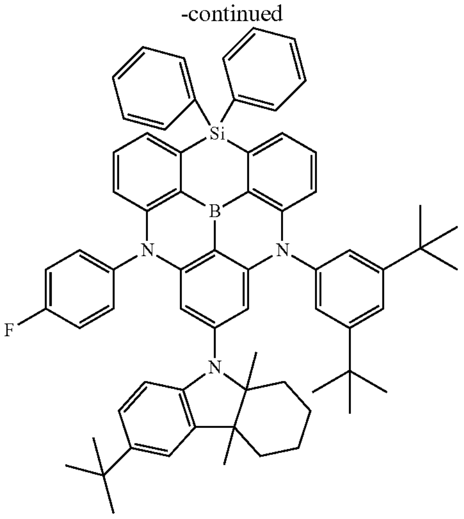
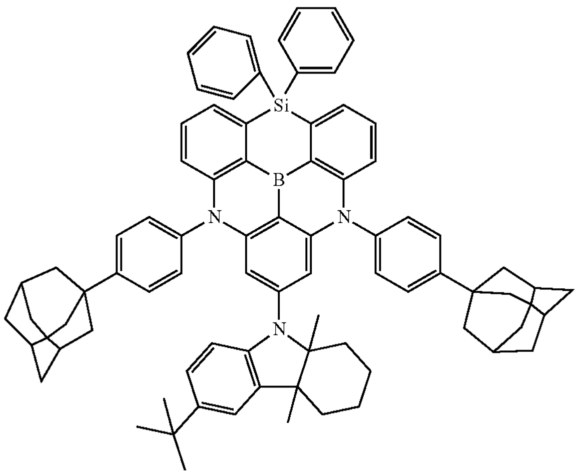
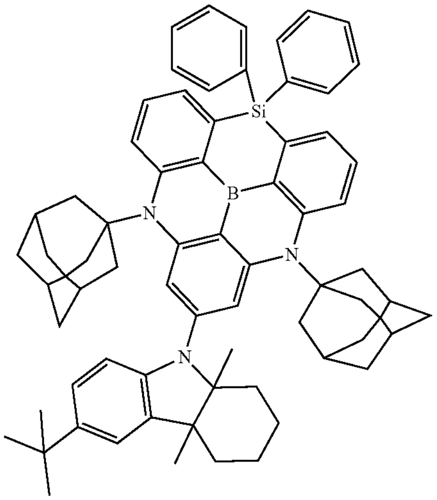

-continued
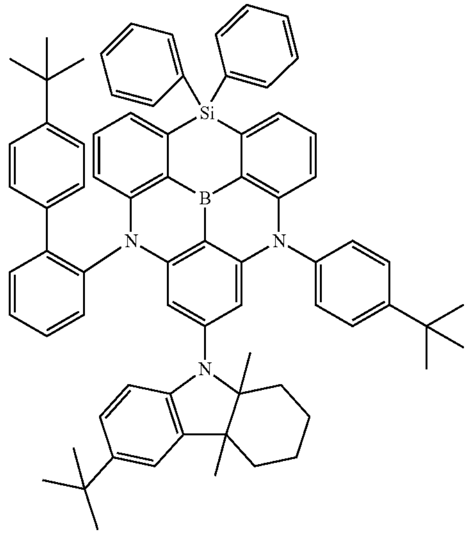
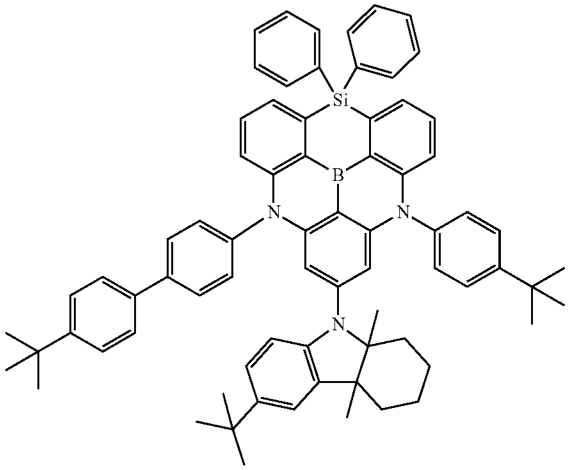
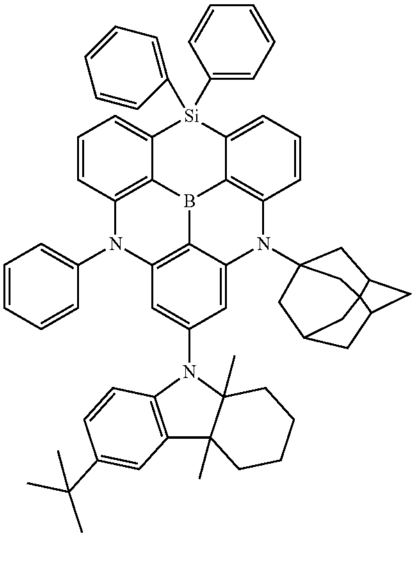
-continued
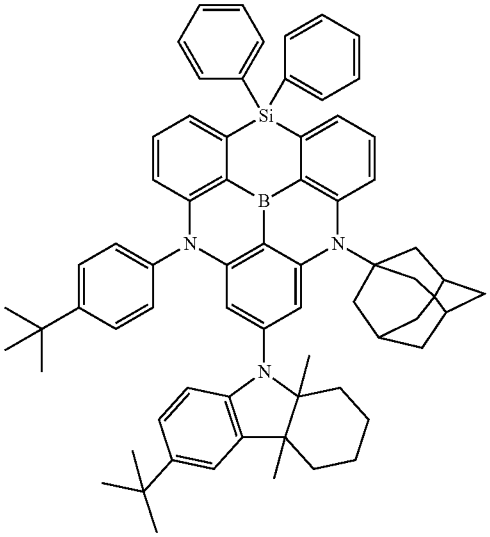
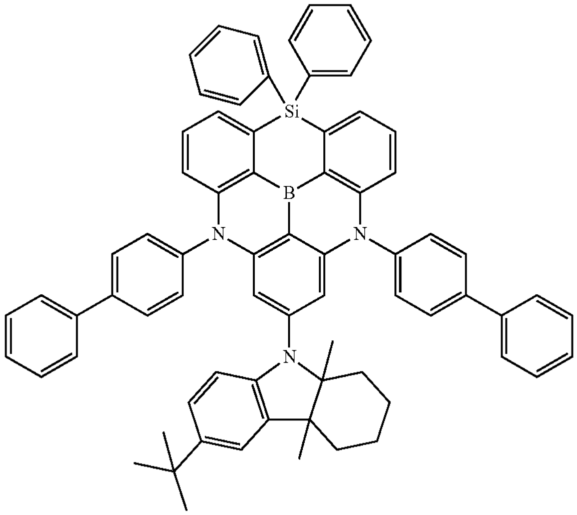
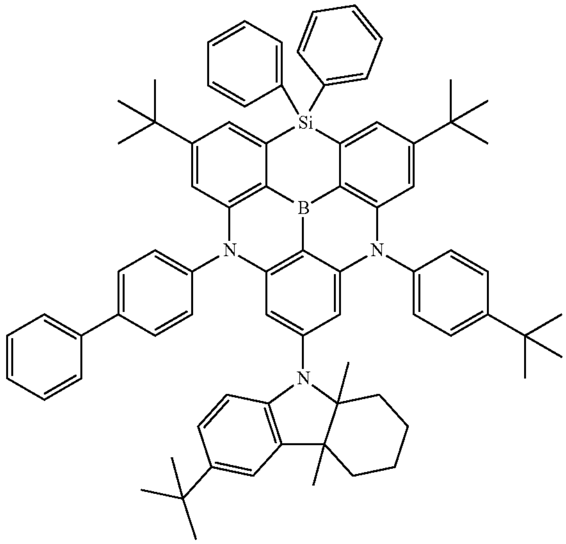

-continued
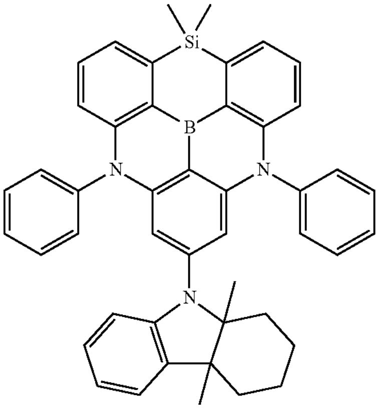
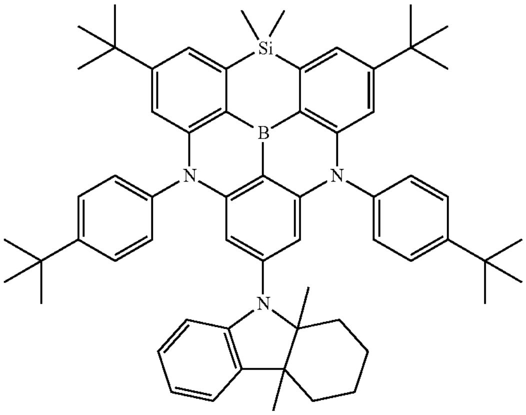
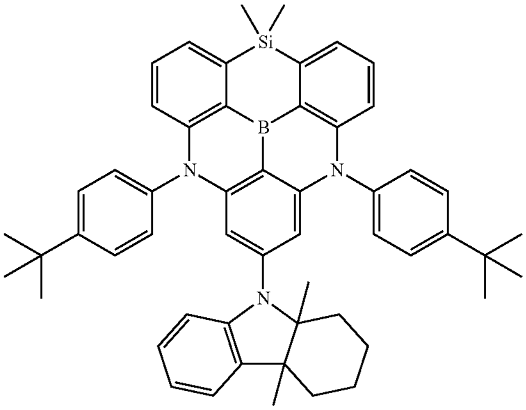
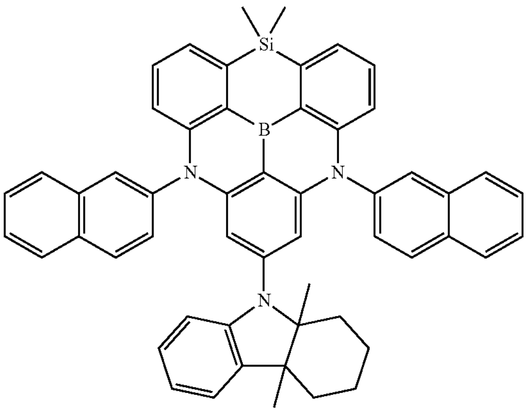
-continued
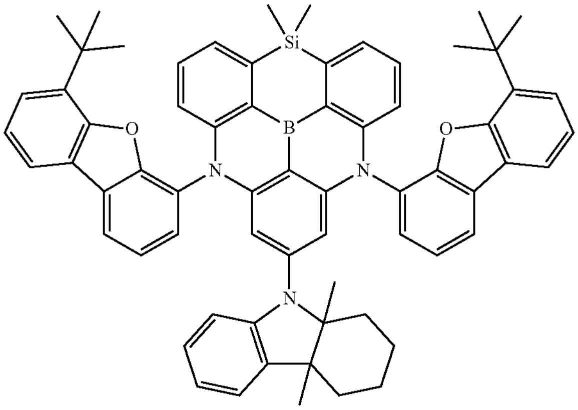
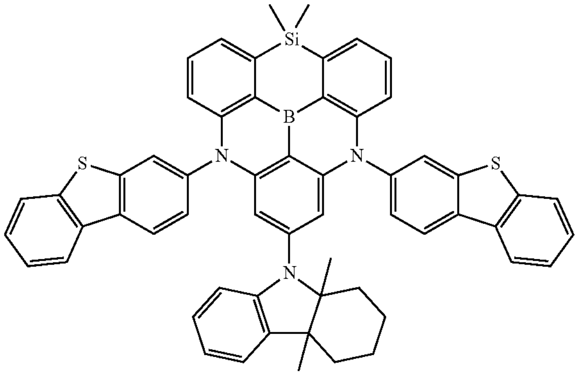
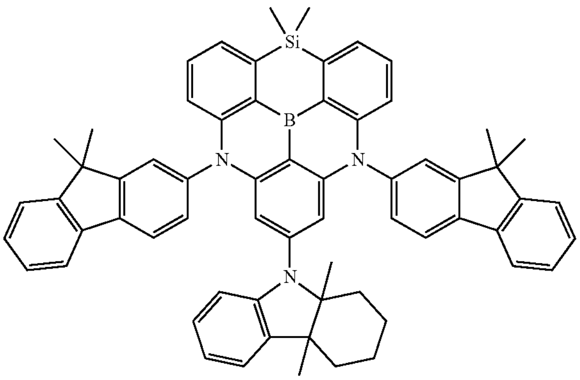
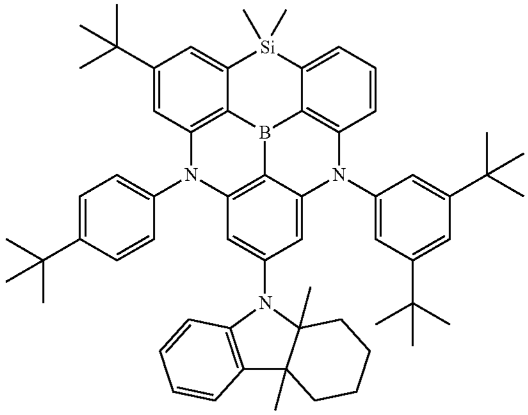

-continued
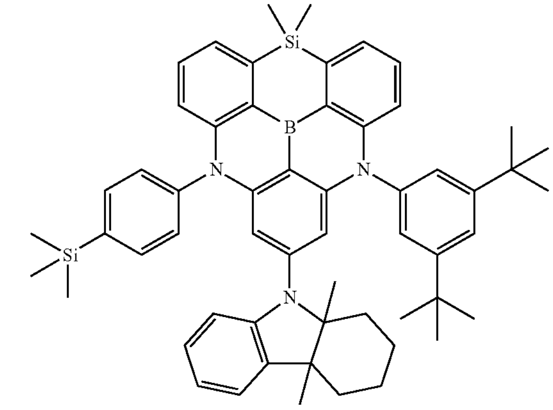
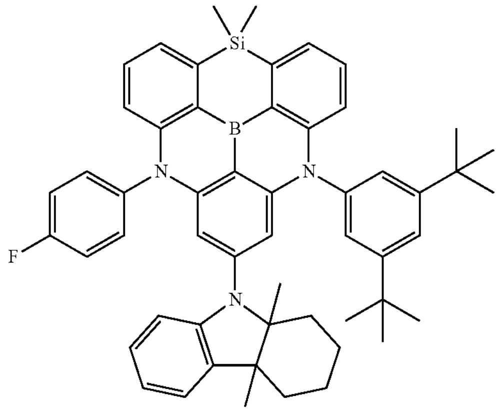
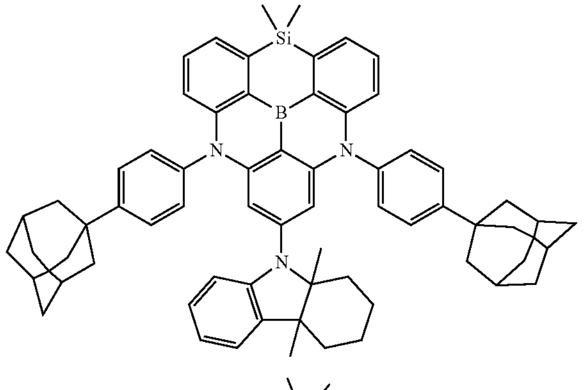
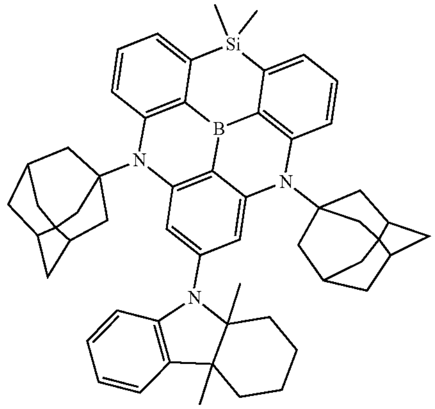
-continued
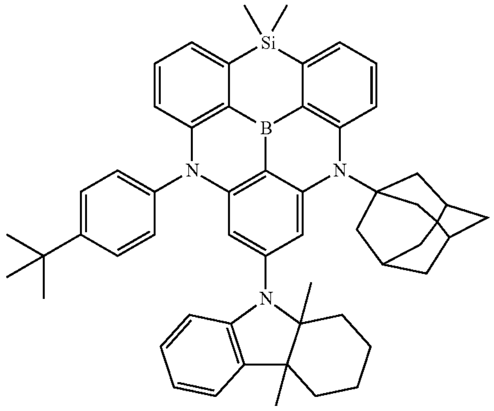
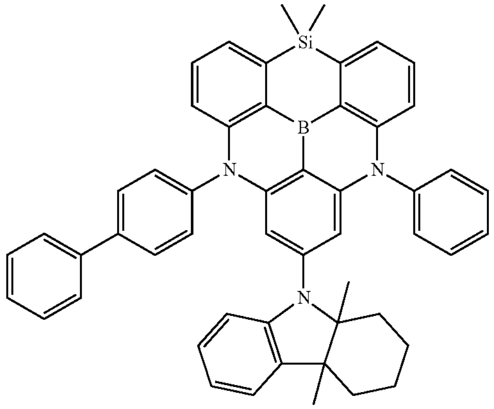
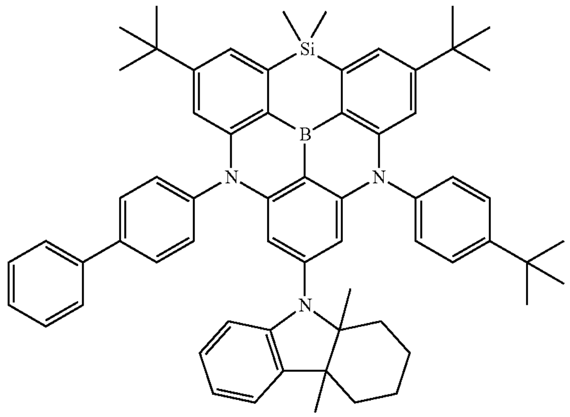
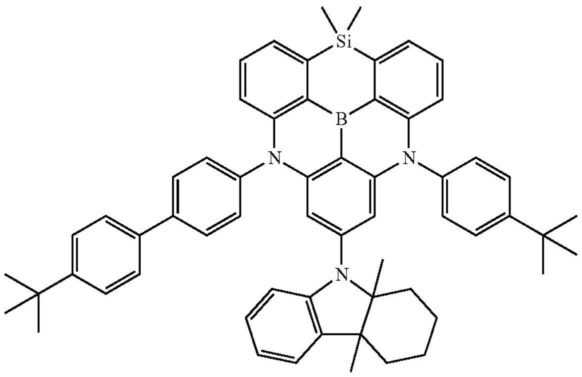

-continued
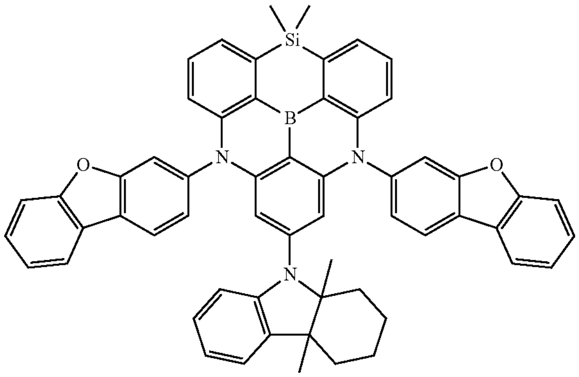
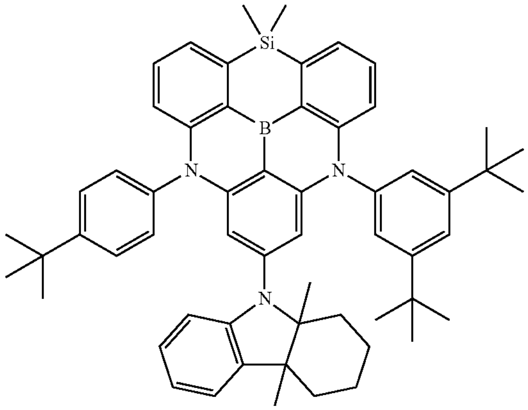
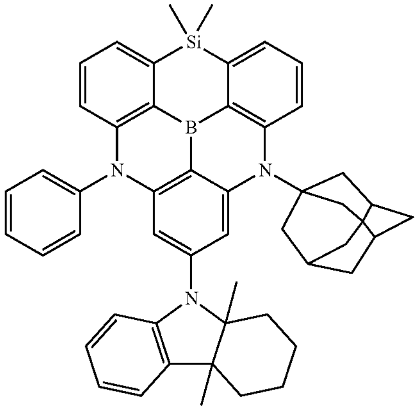
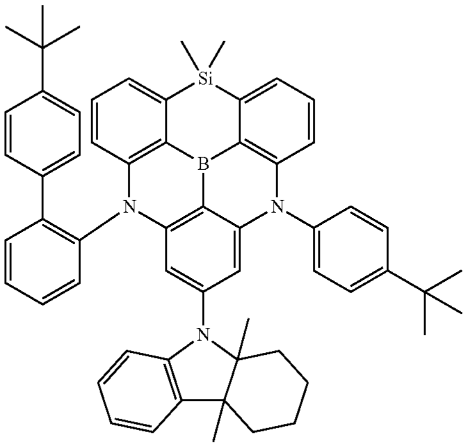
-continued
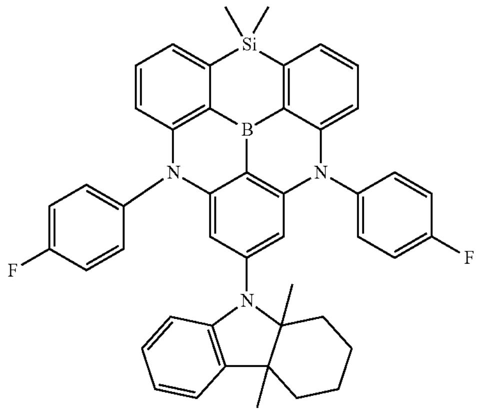
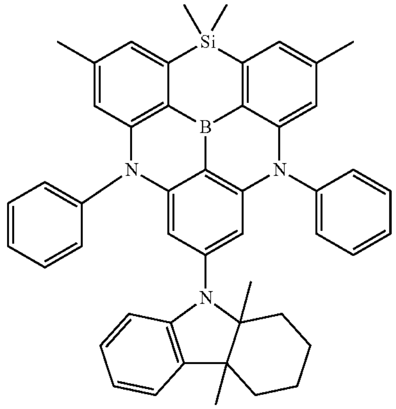
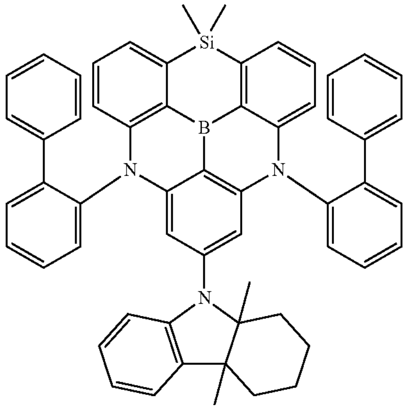
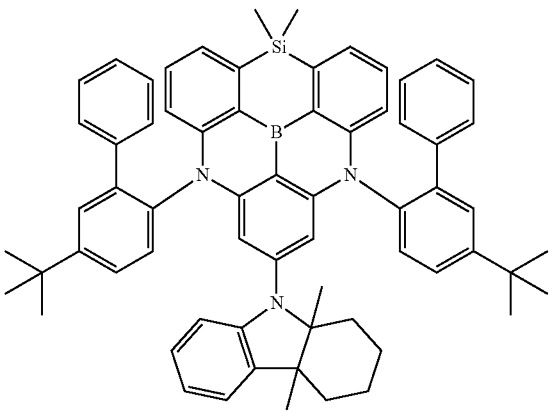

-continued
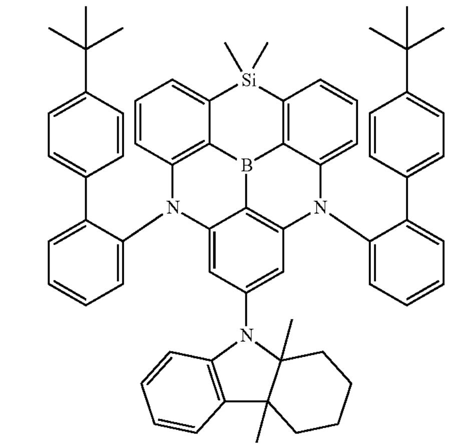
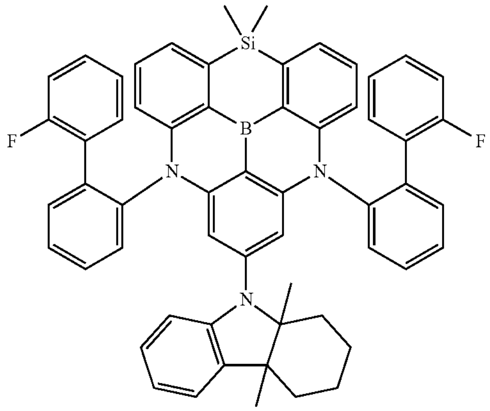
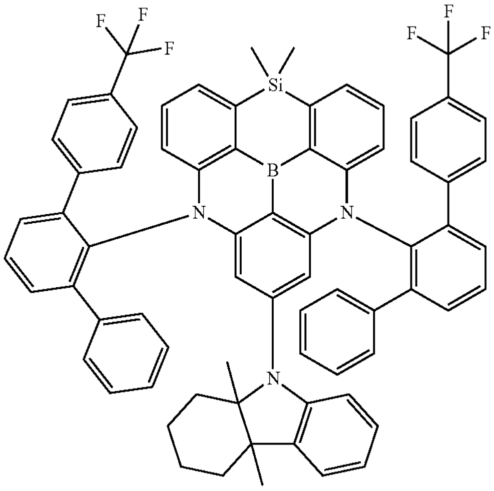
-continued
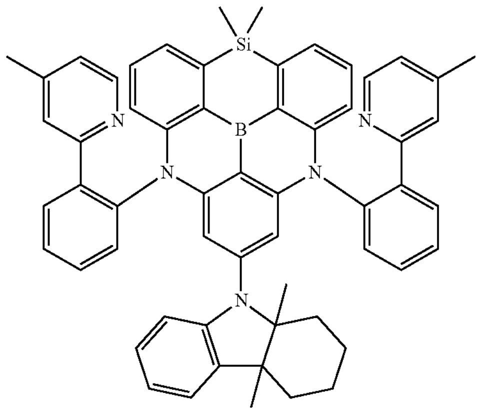
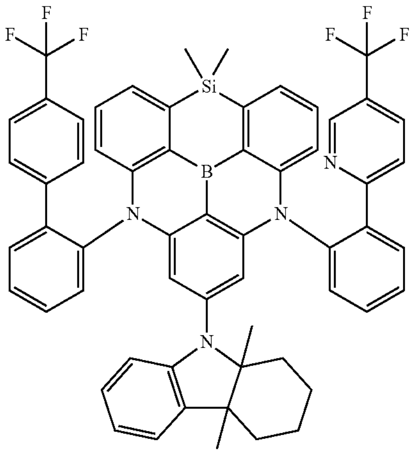
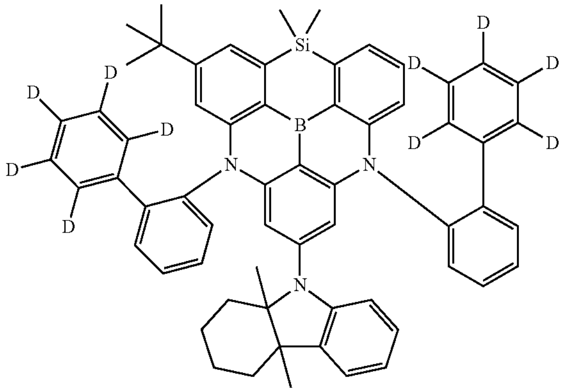
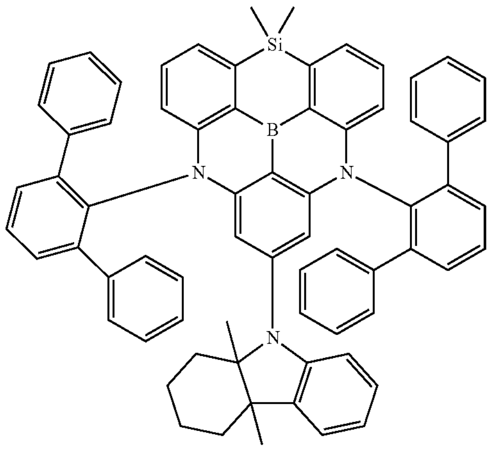

-continued
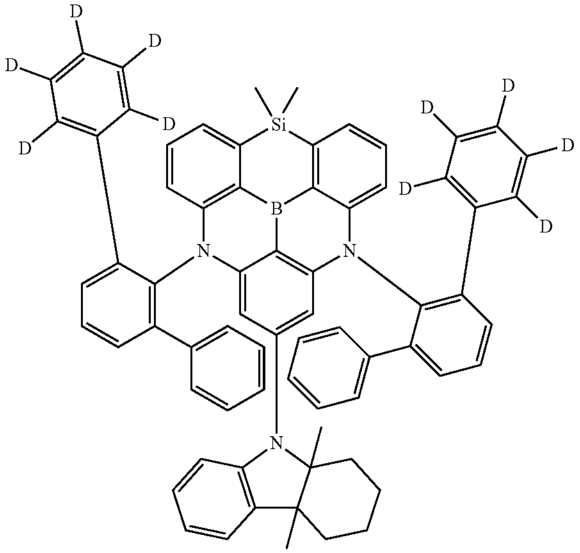
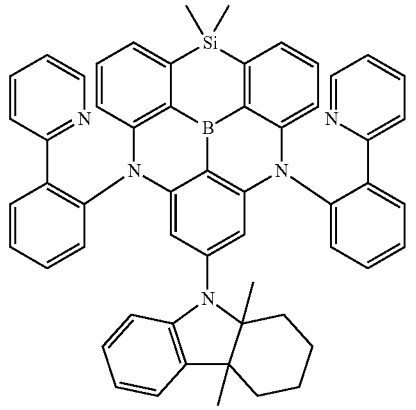
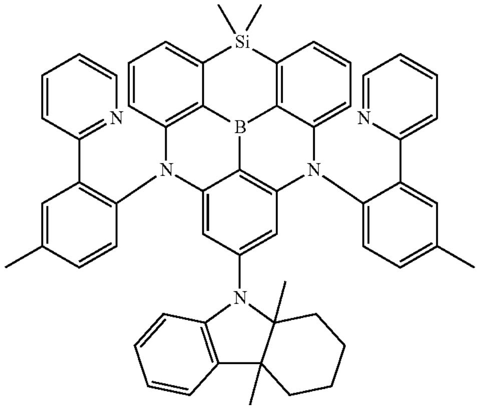
-continued
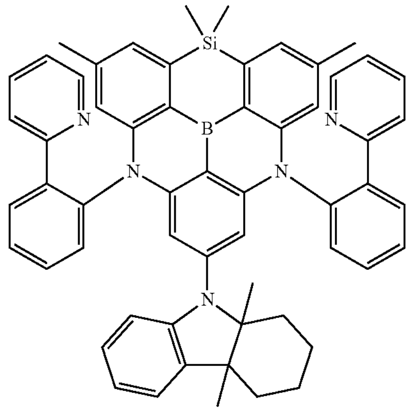
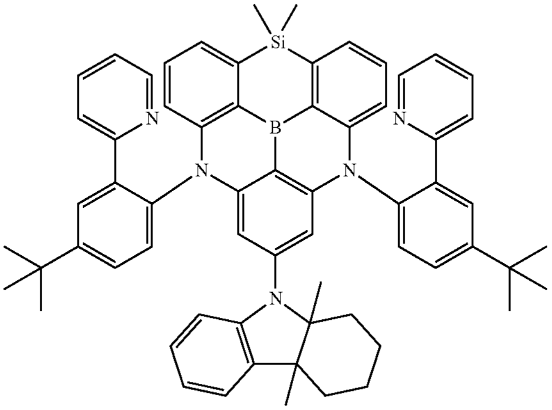
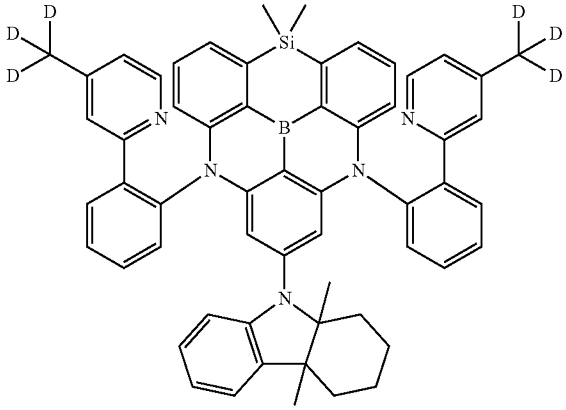
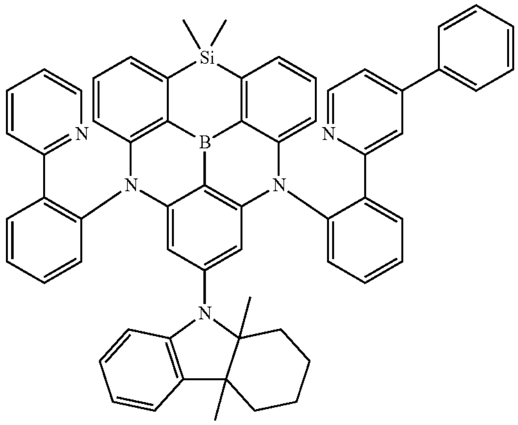

-continued
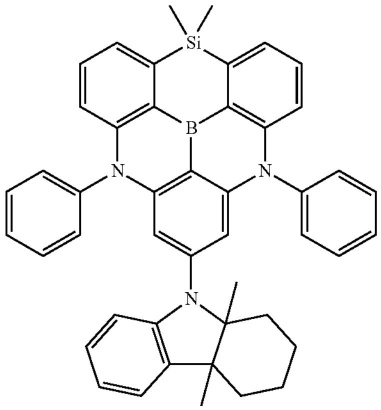
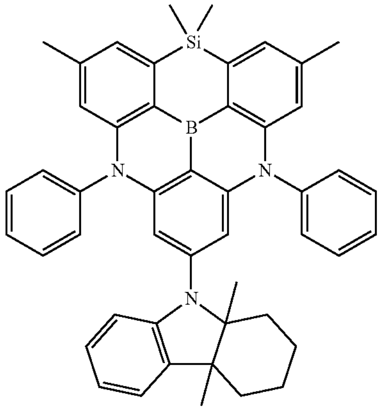
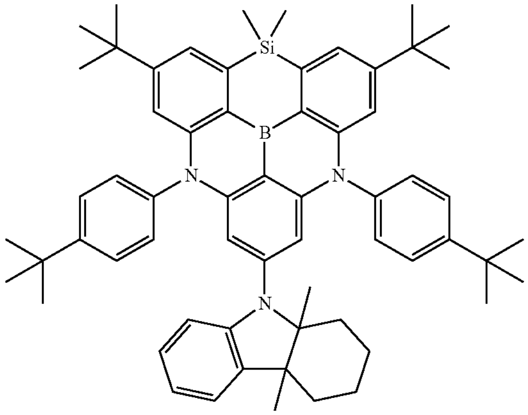
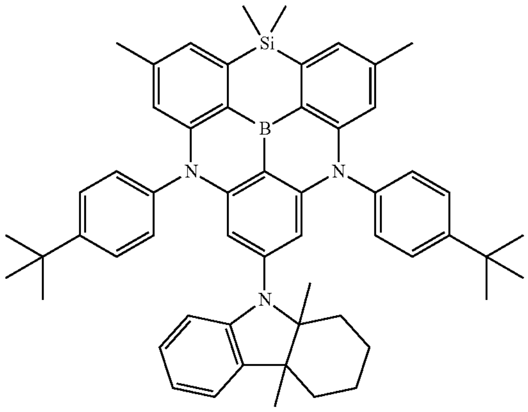
-continued
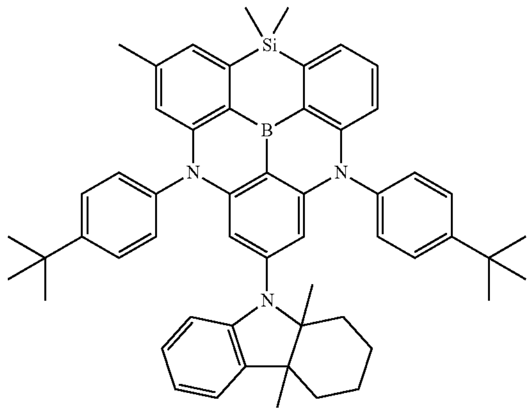
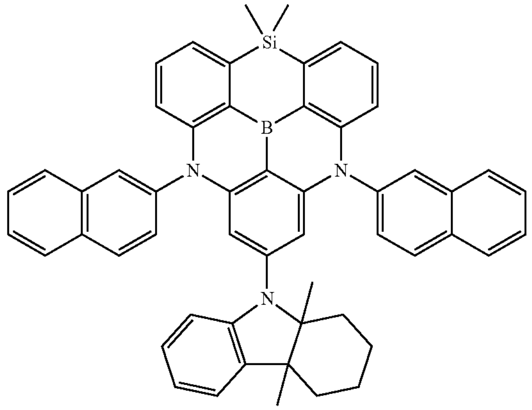
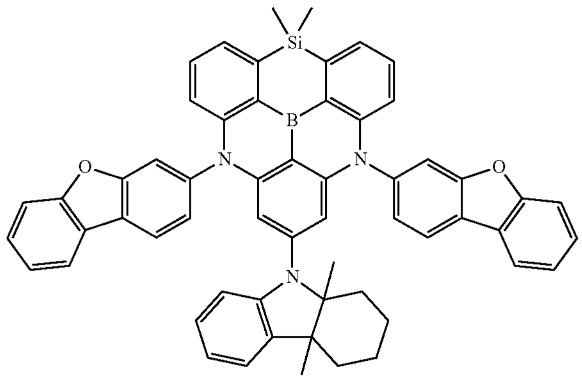
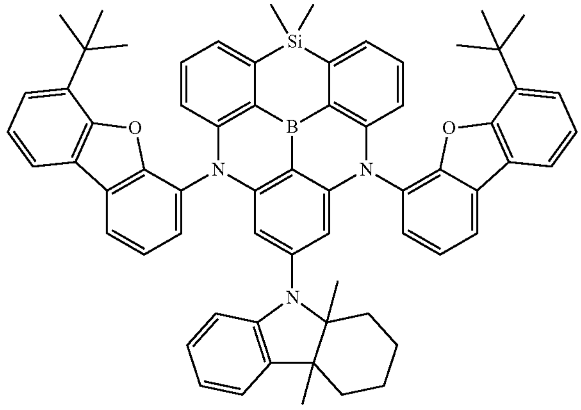

-continued
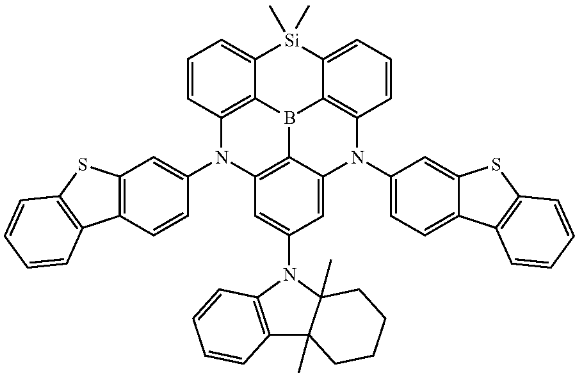
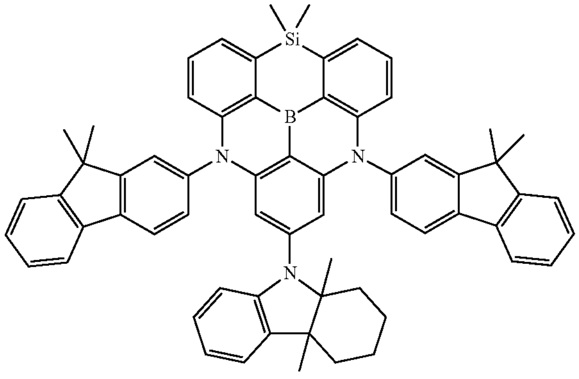
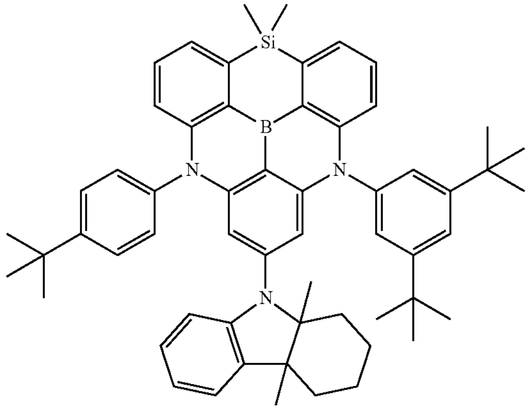
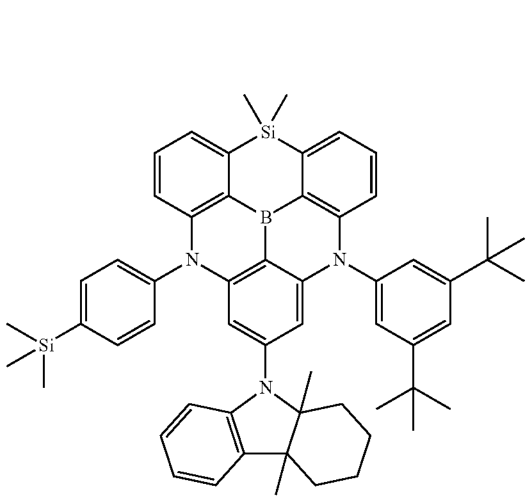
-continued
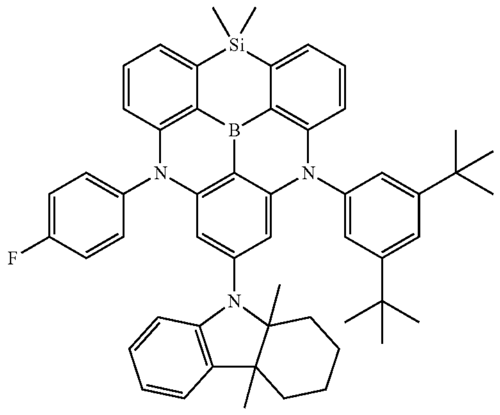
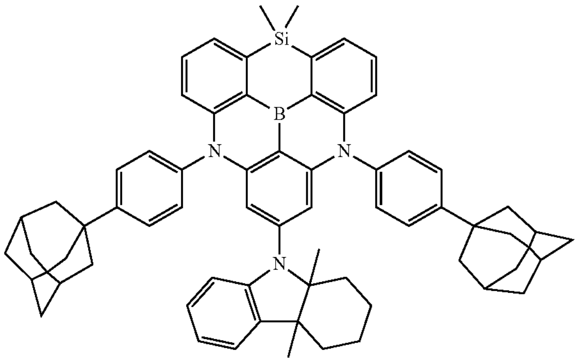
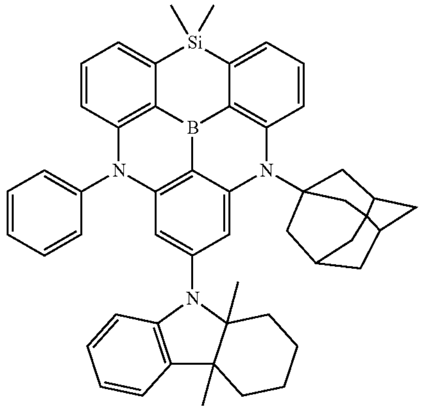
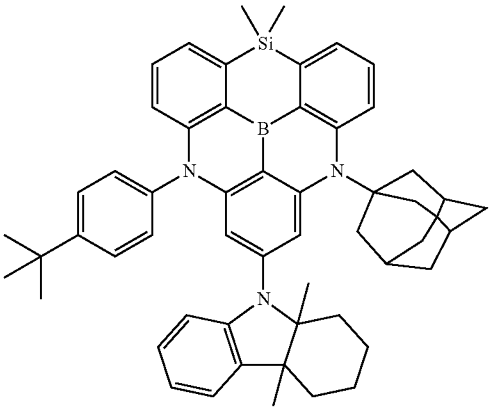

-continued
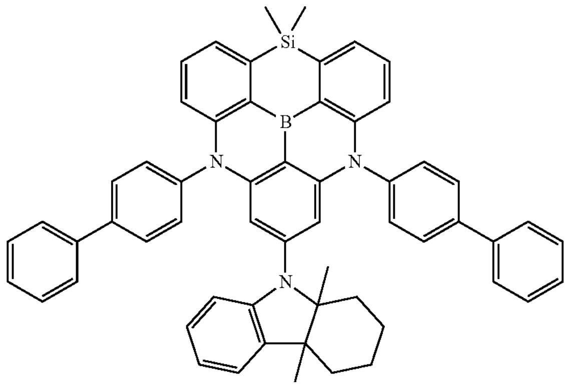
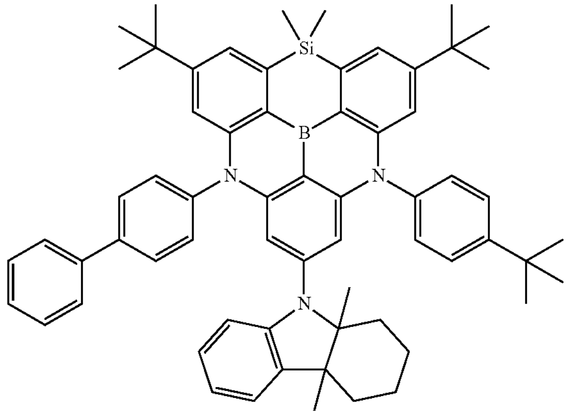
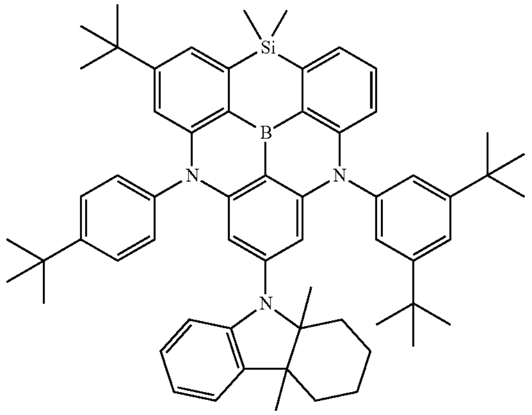
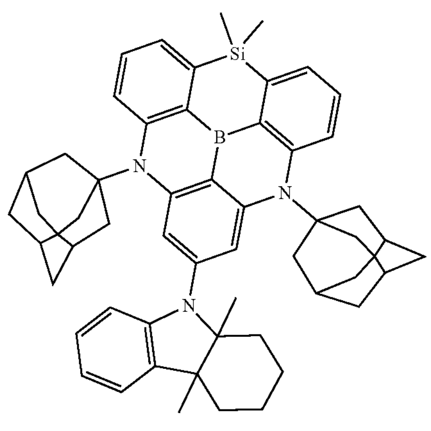
-continued
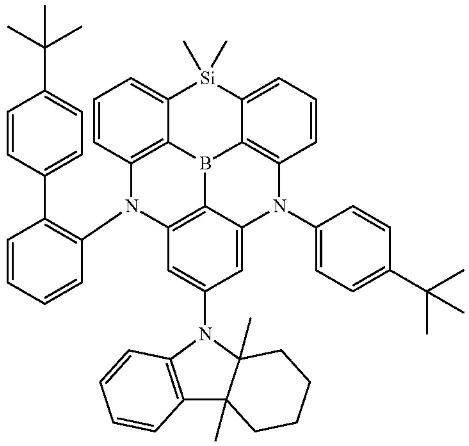
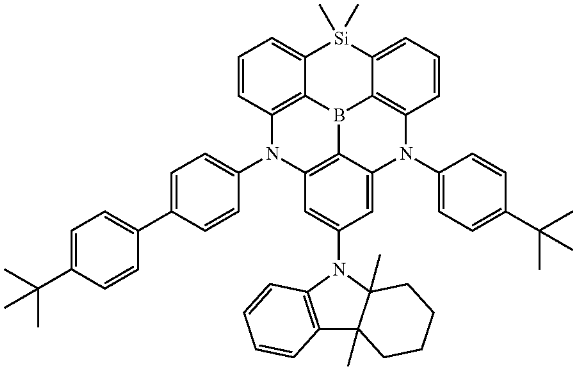
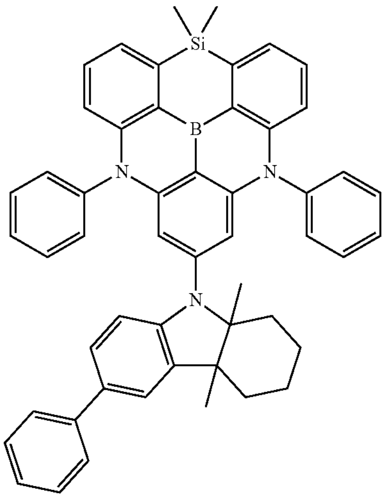

-continued
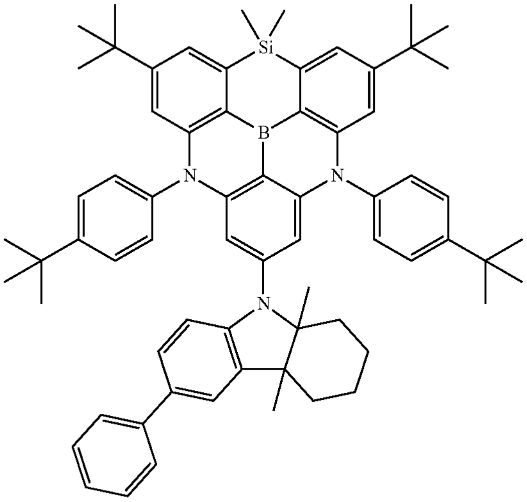
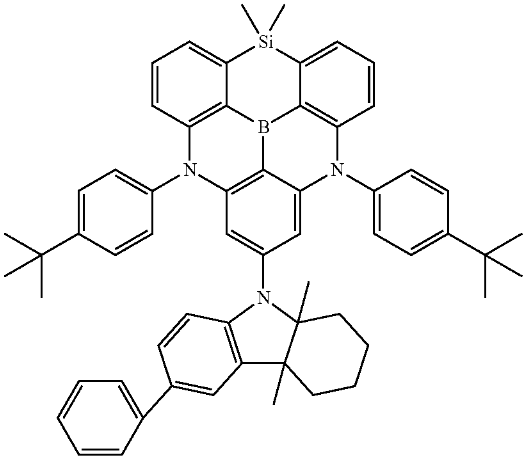
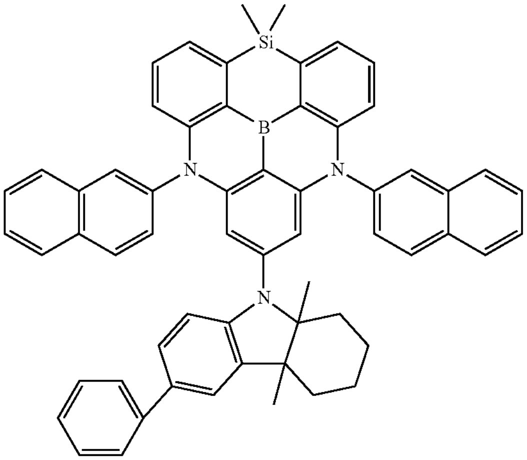
-continued
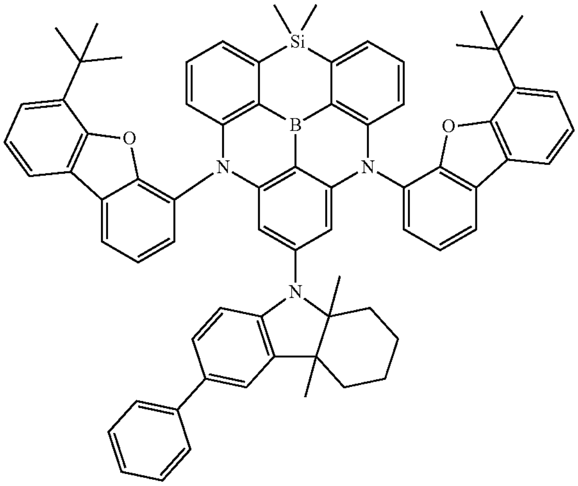
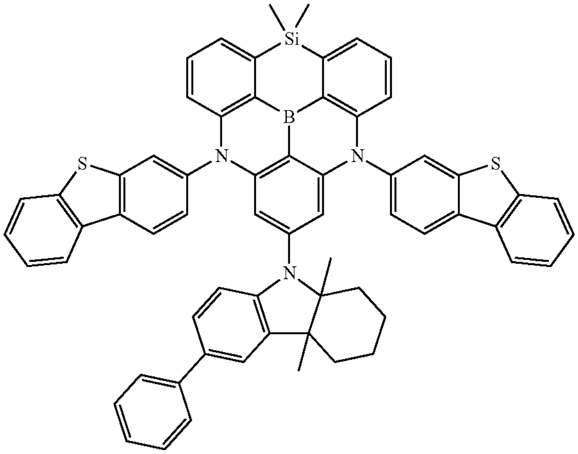
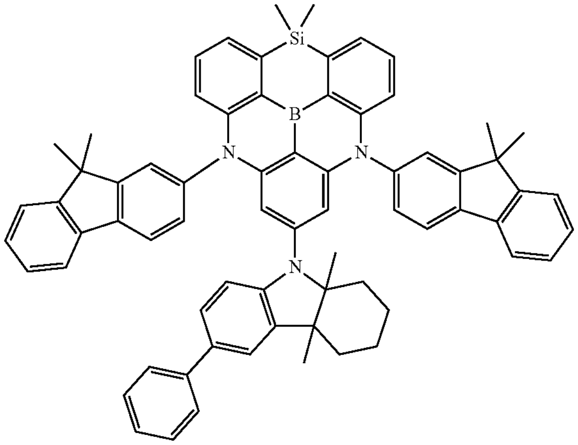

-continued
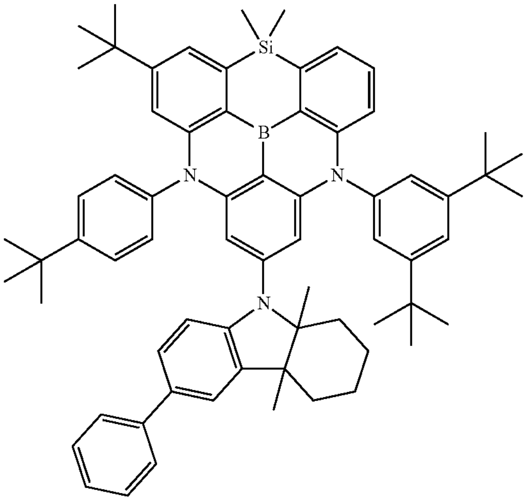
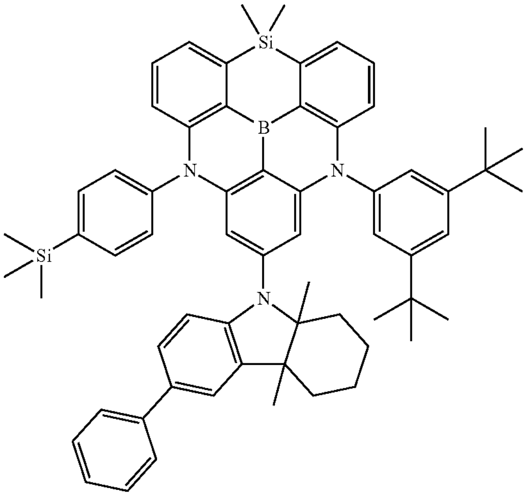
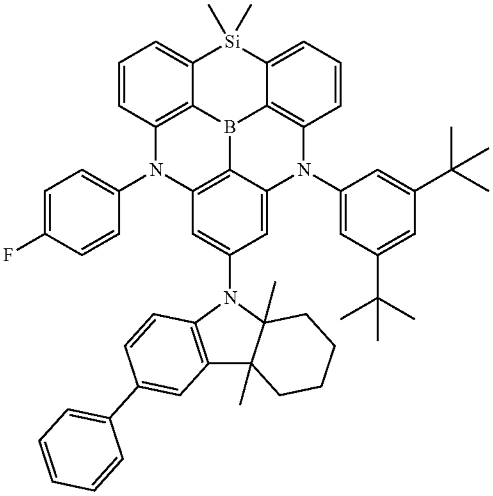
-continued
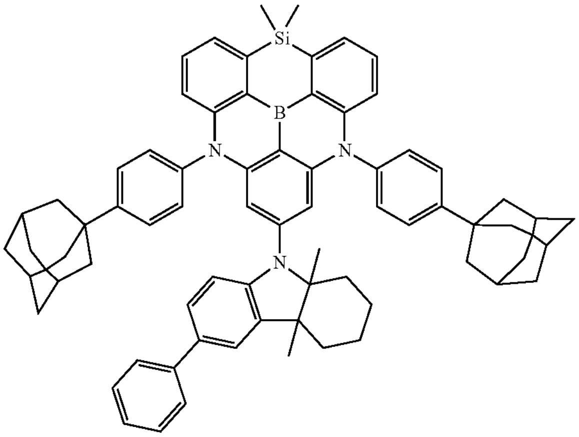
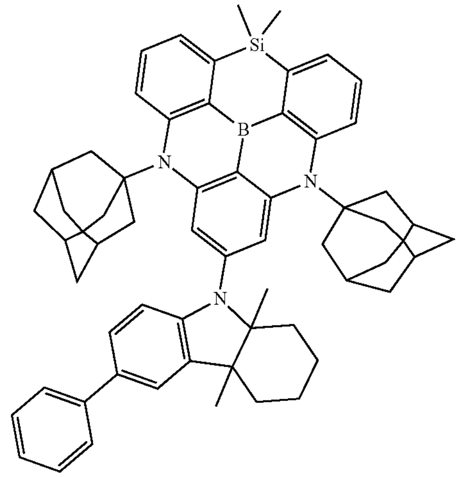
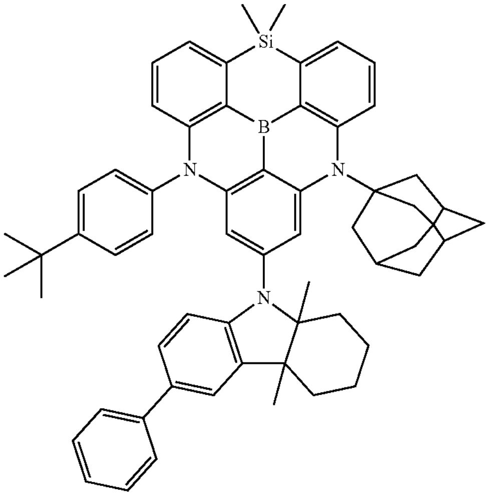

-continued
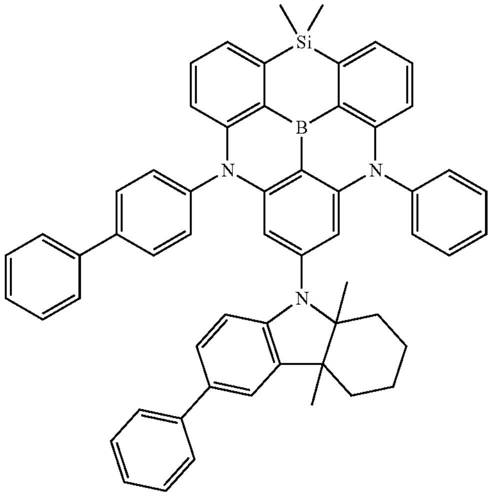
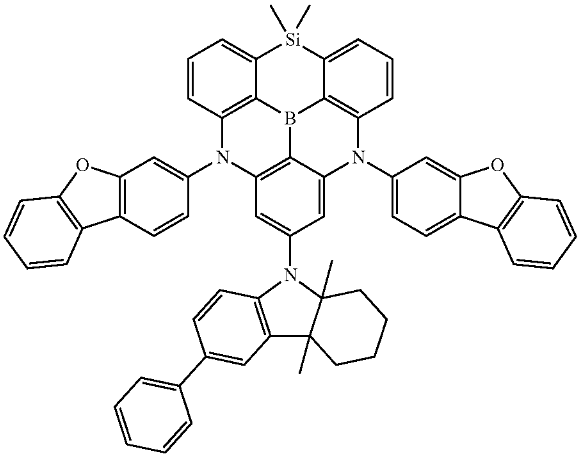
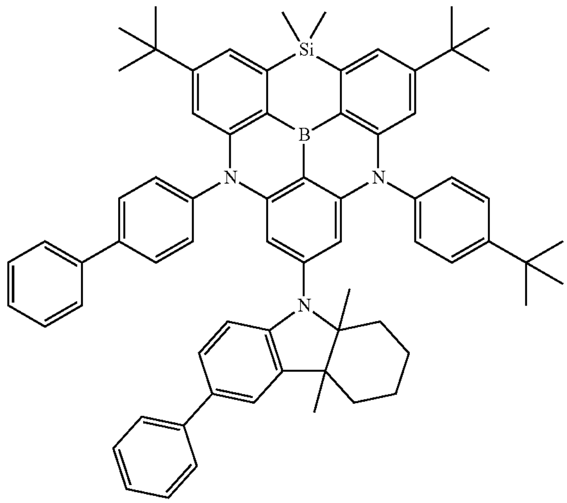
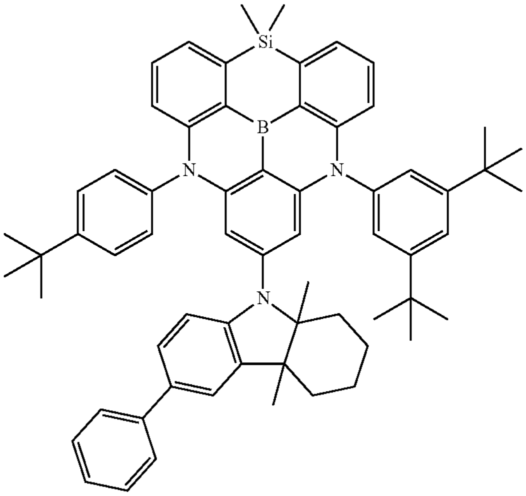
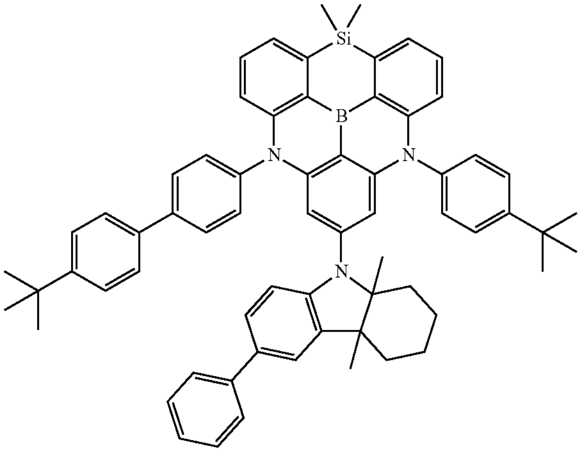
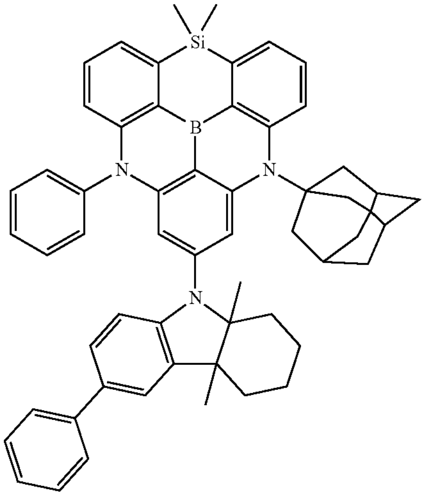
-continued -continued
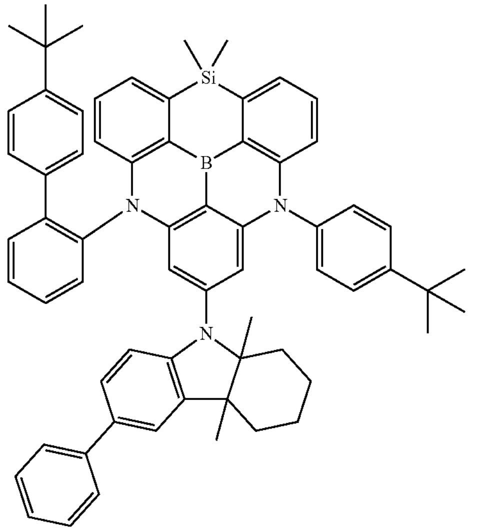
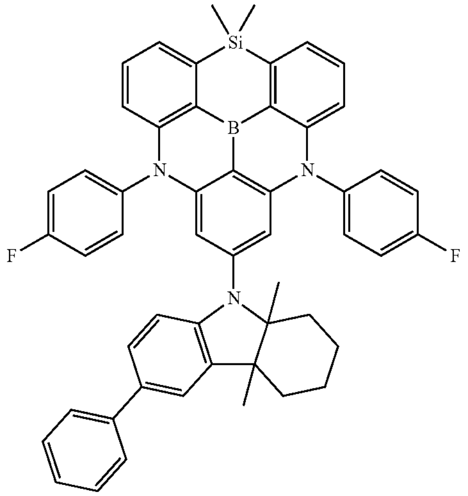
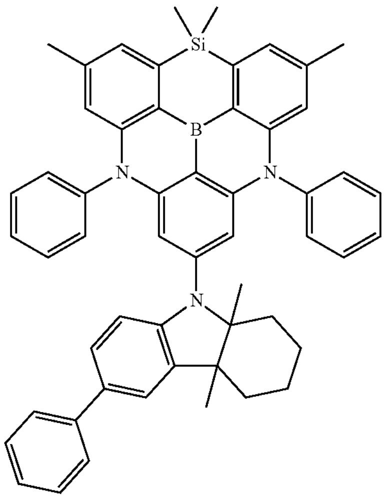
-continued
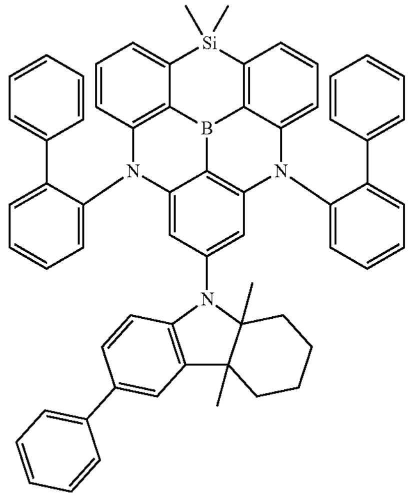
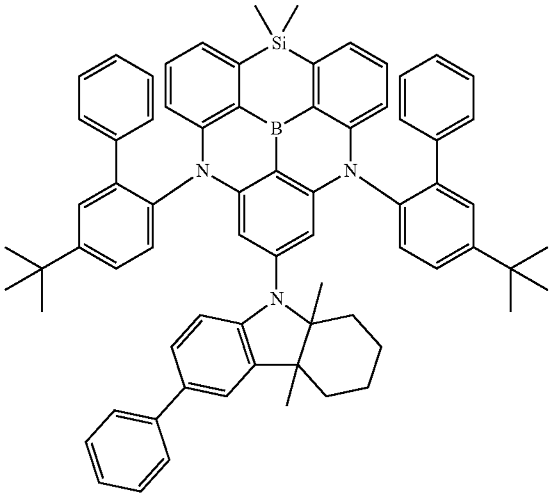
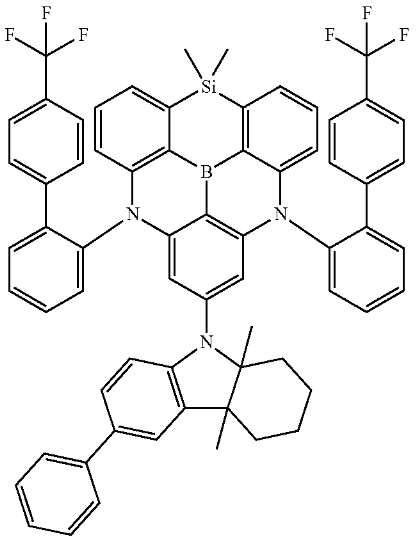

-continued
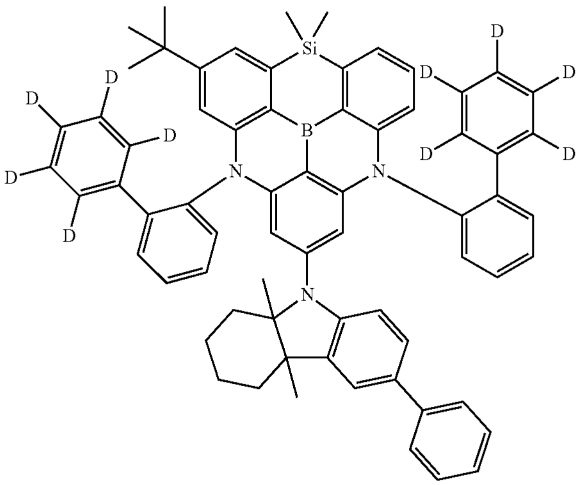
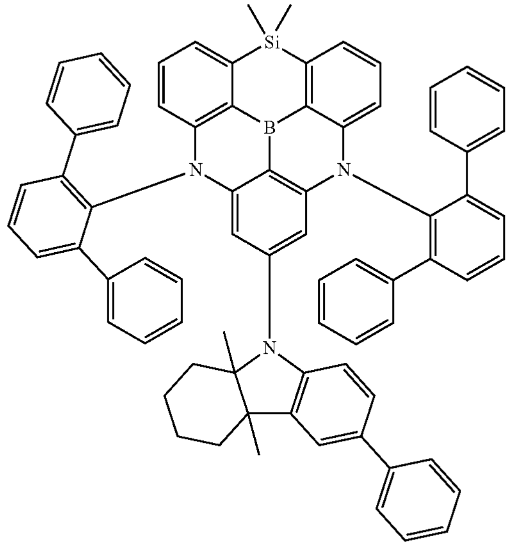
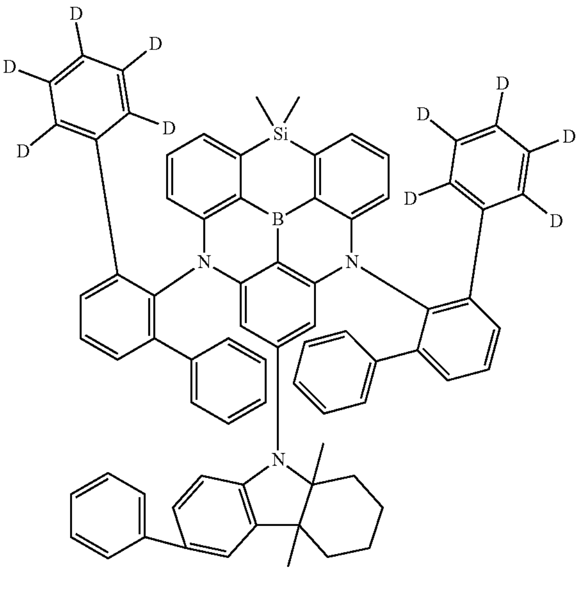
-continued
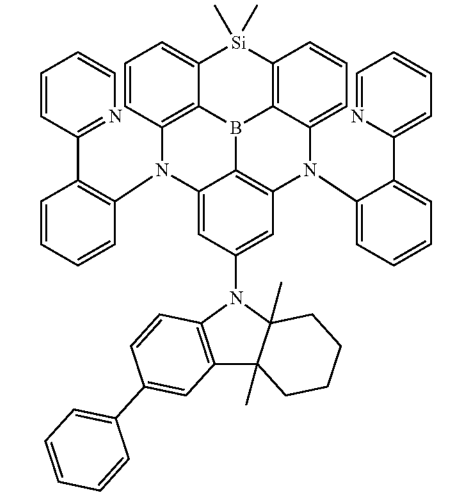
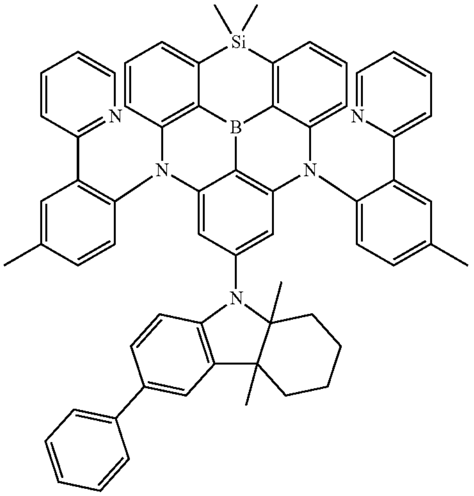
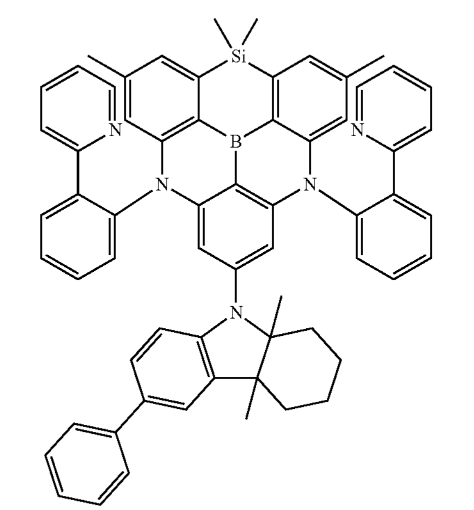

-continued
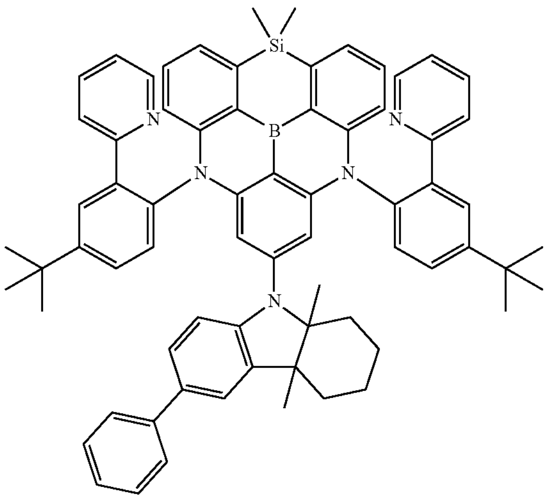
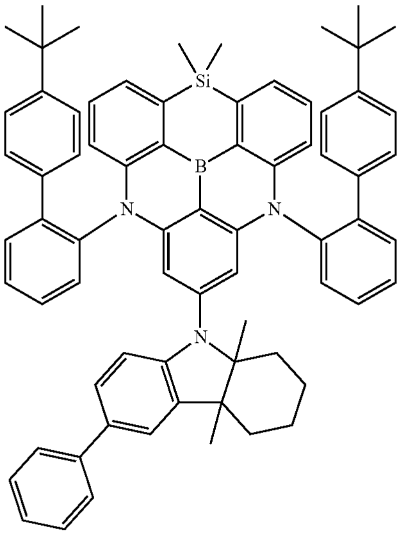
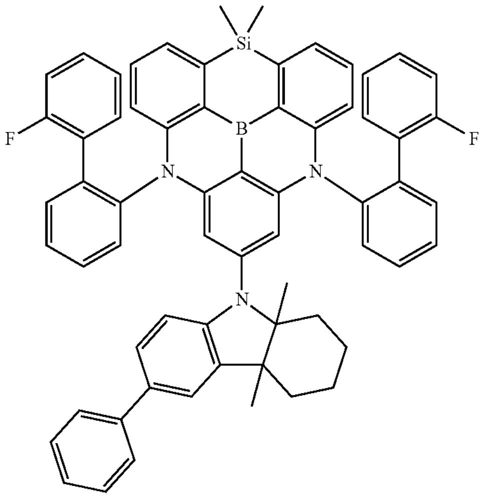
-continued
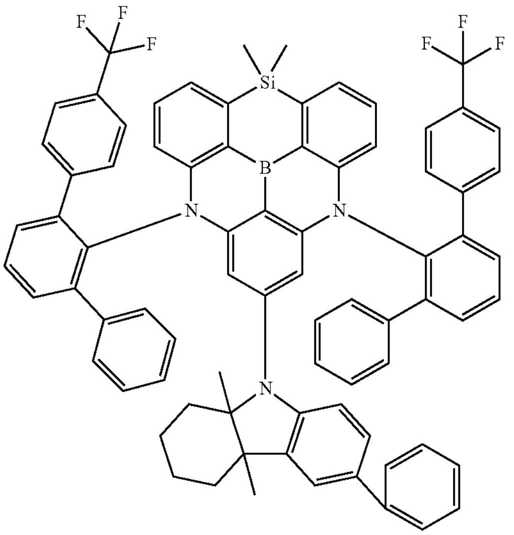
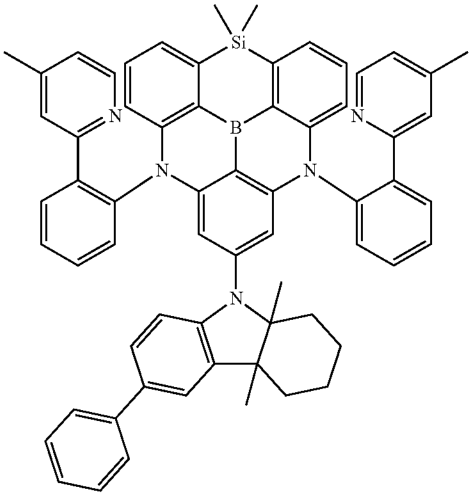
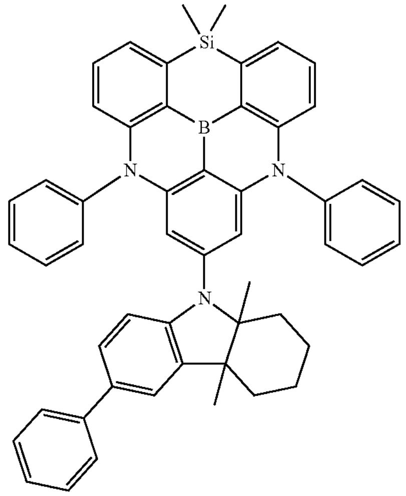

-continued
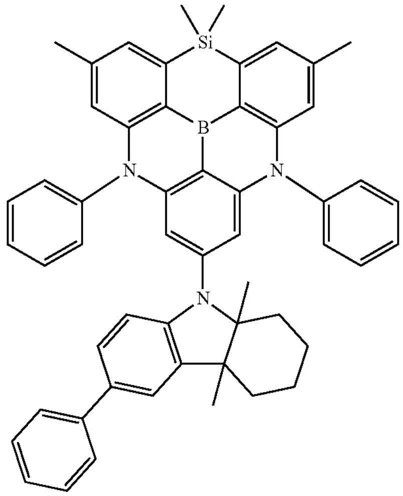
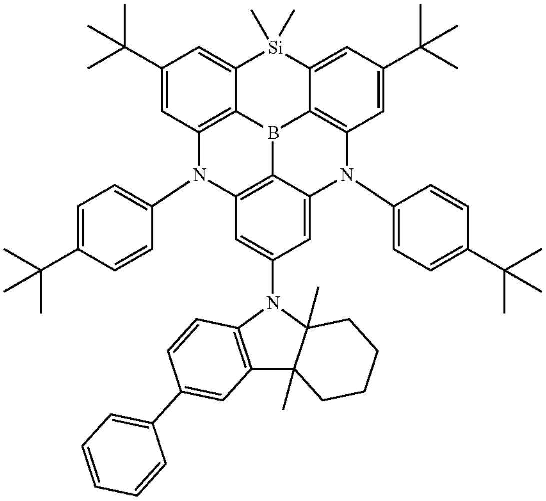
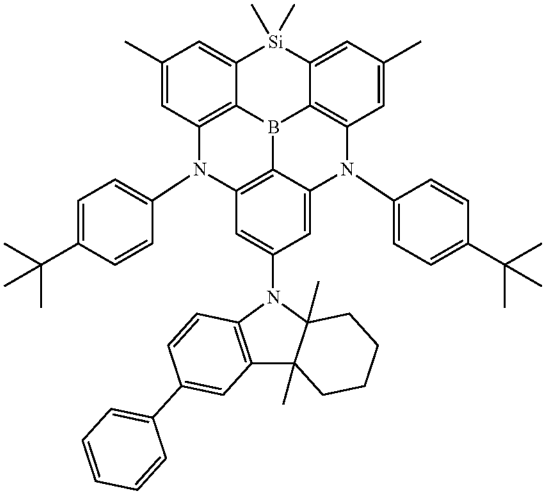
-continued
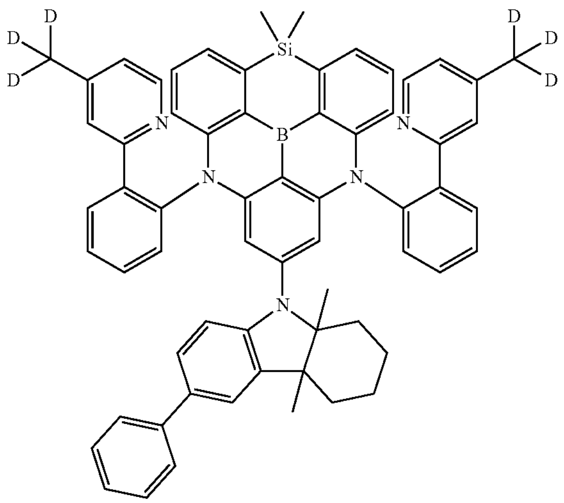
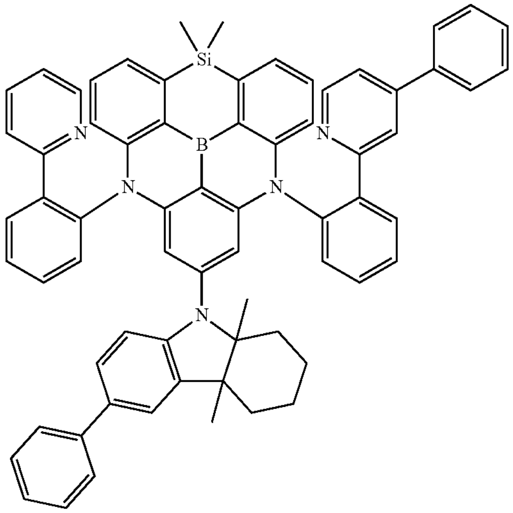
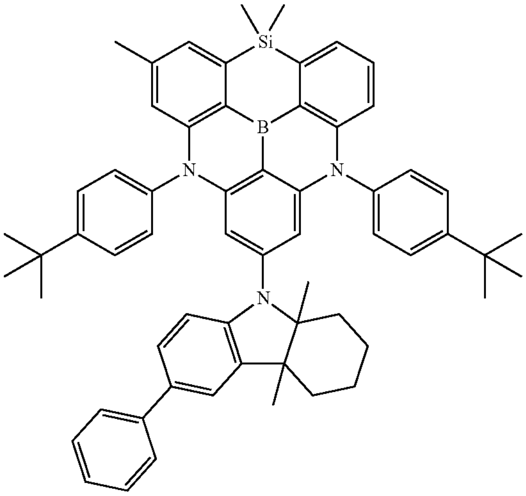

-continued
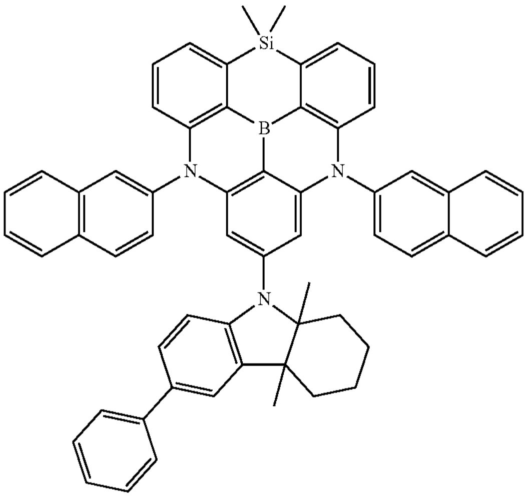
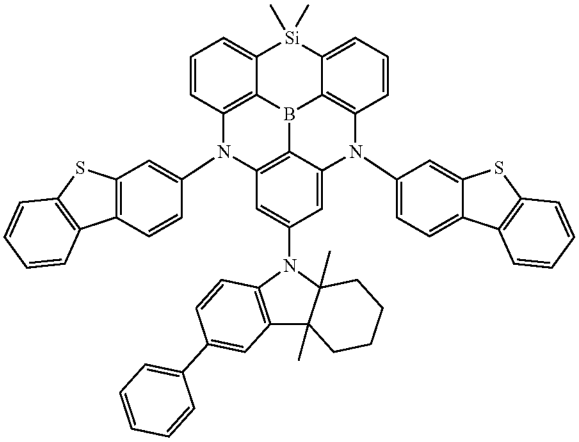
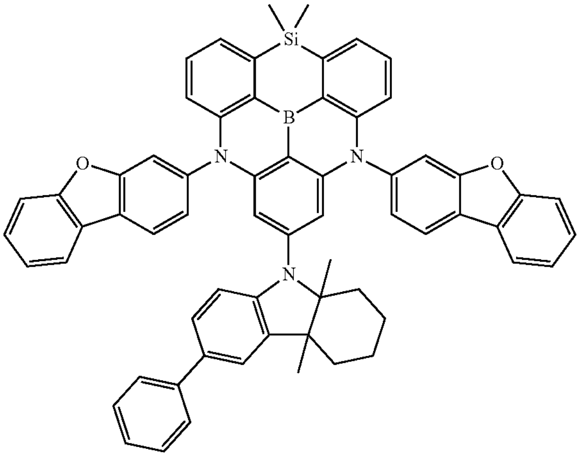
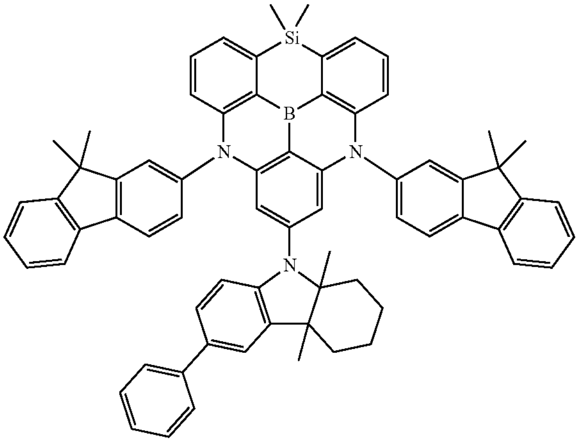
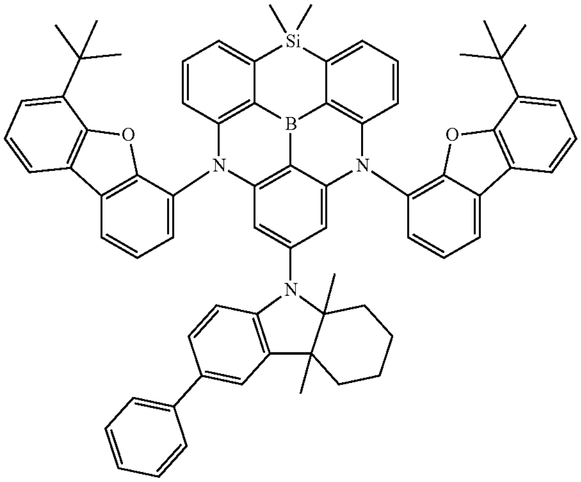
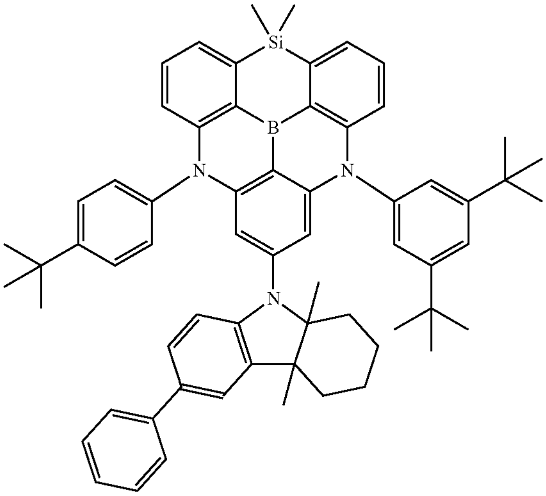
-continued -continued
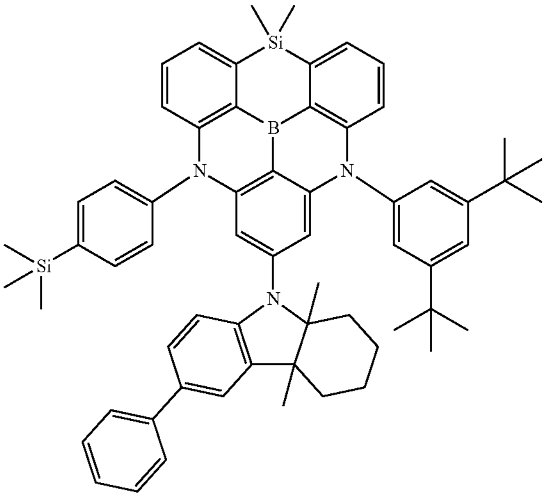
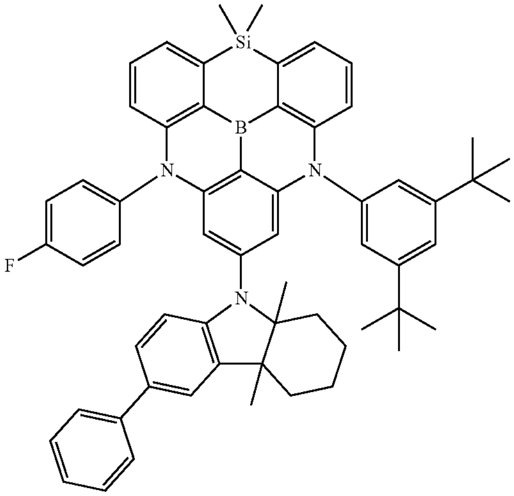
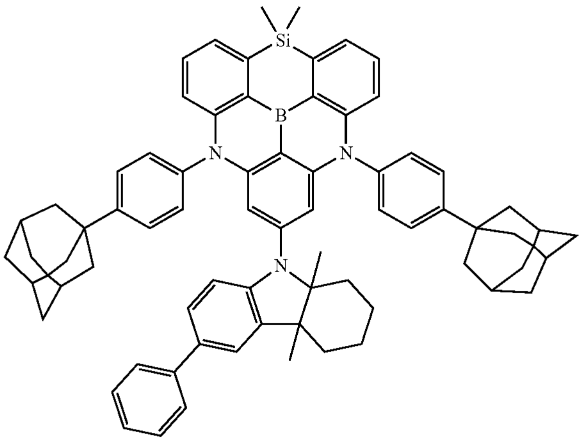
-continued
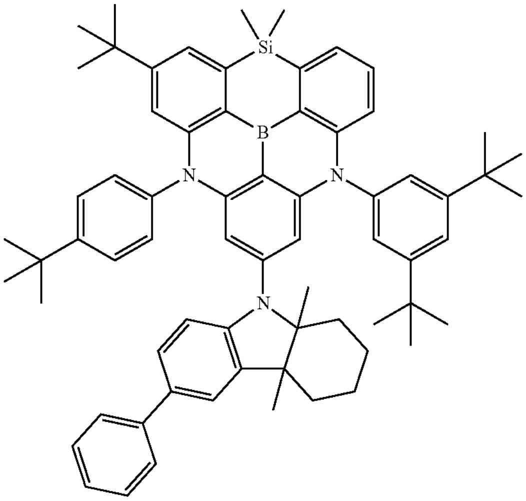
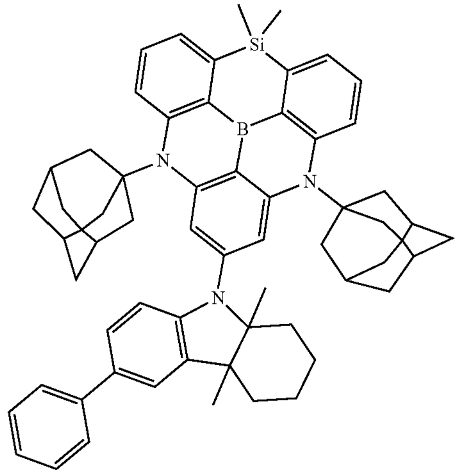
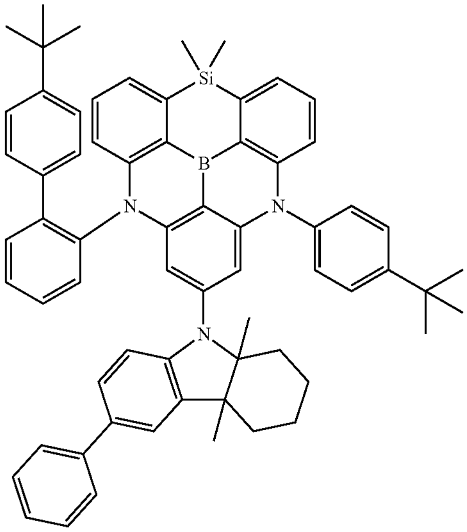

-continued
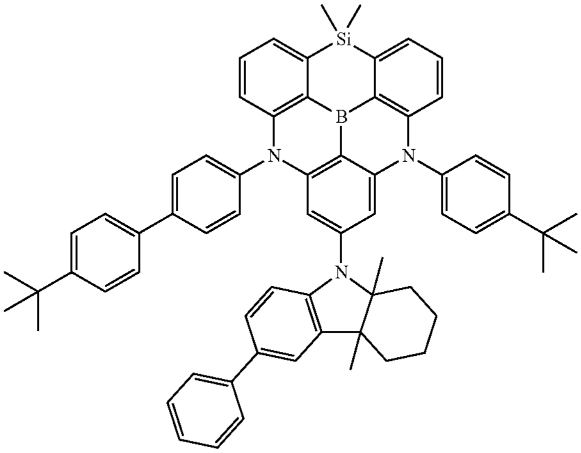
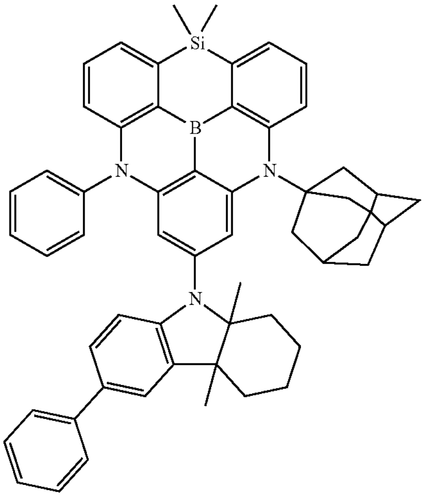
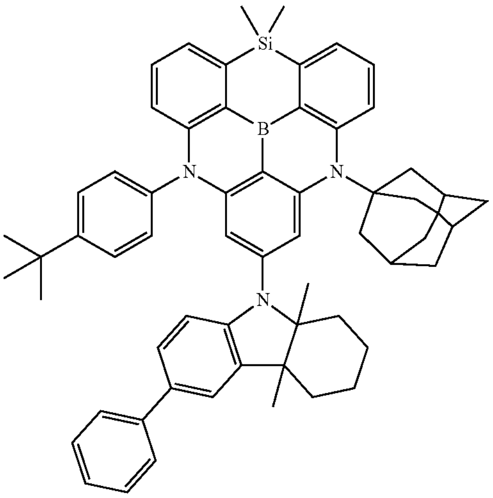
-continued
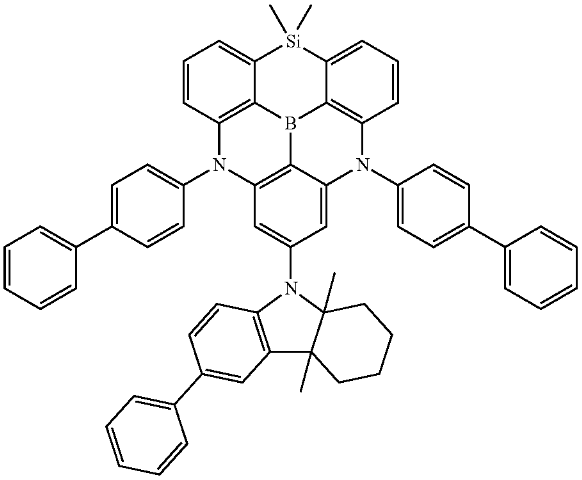
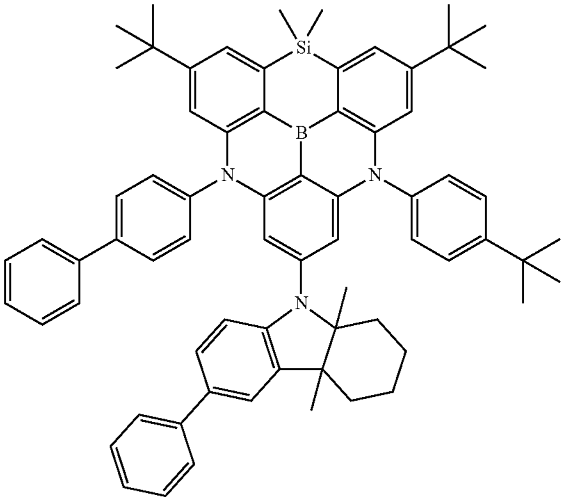
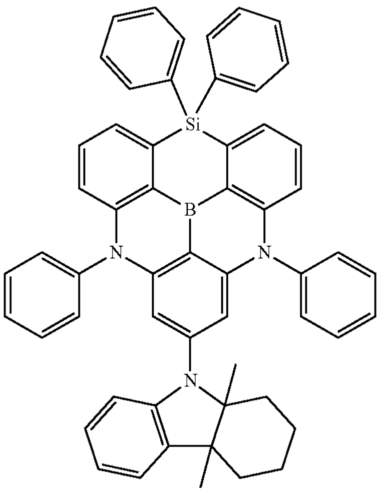

-continued
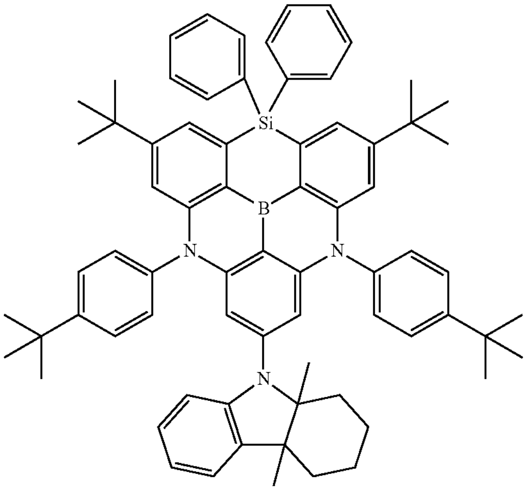
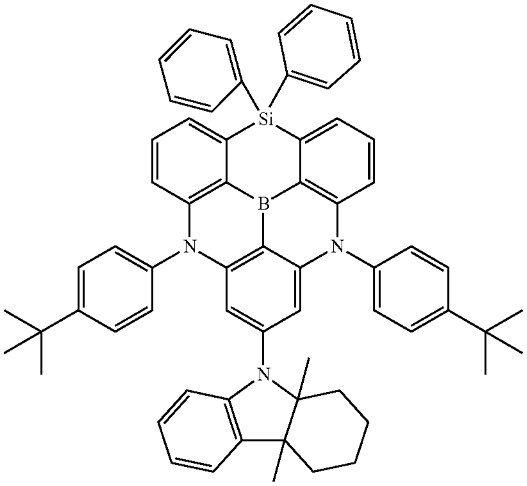
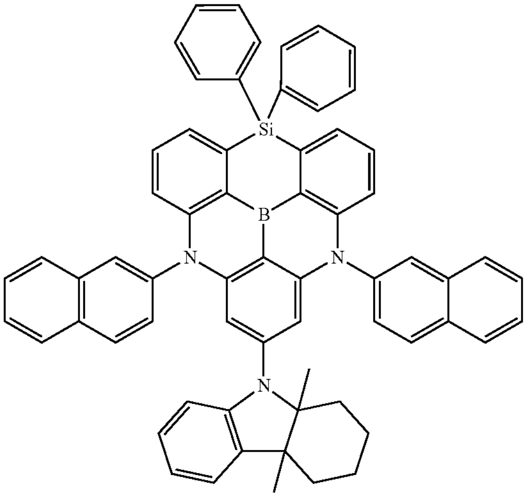
-continued
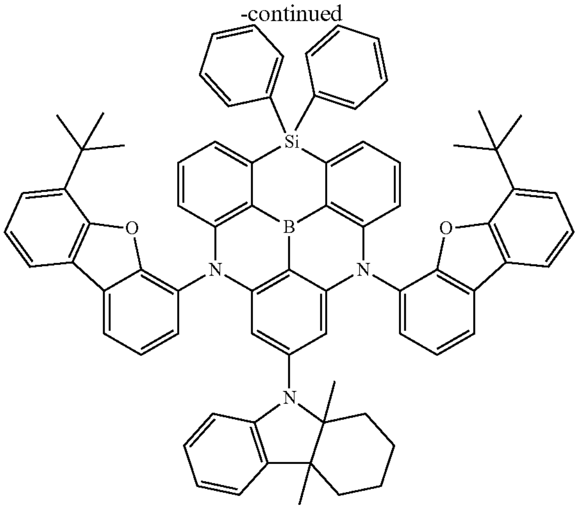
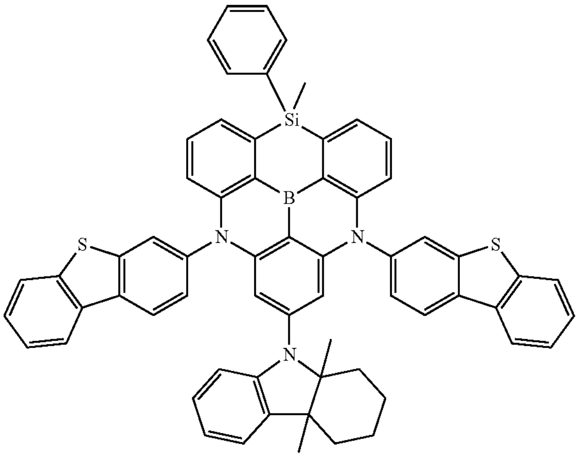
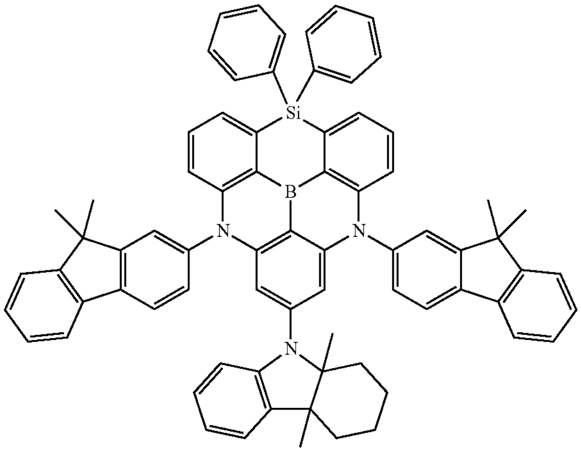

-continued
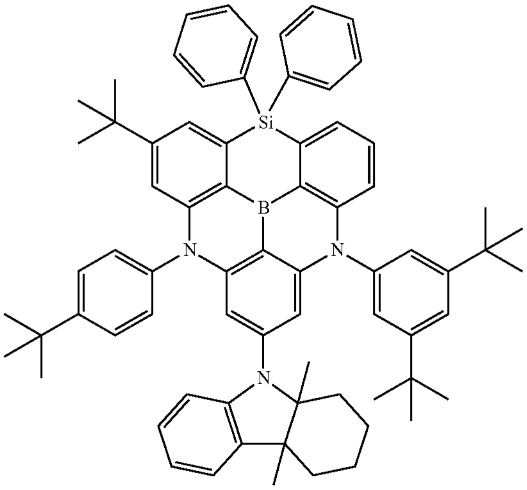
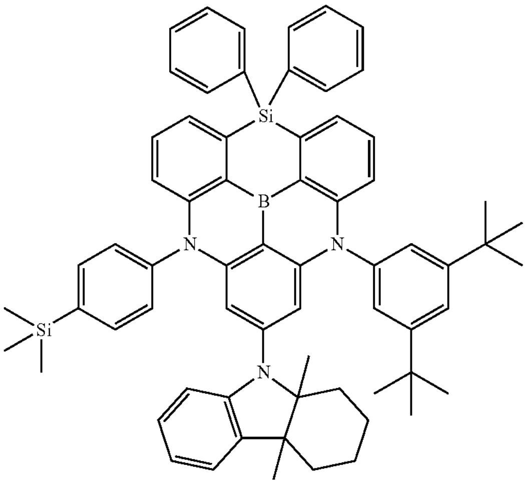
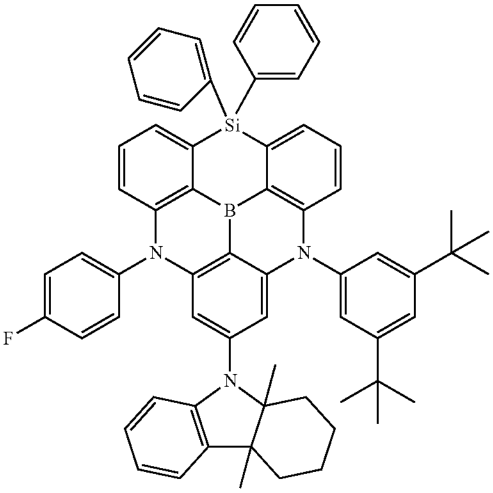
-continued
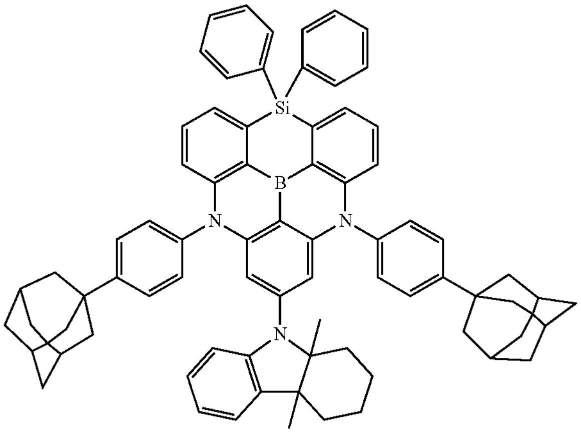
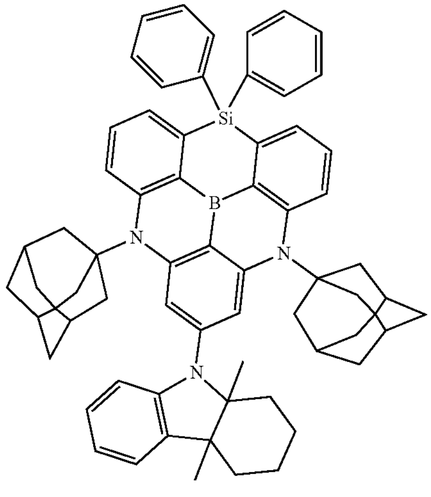
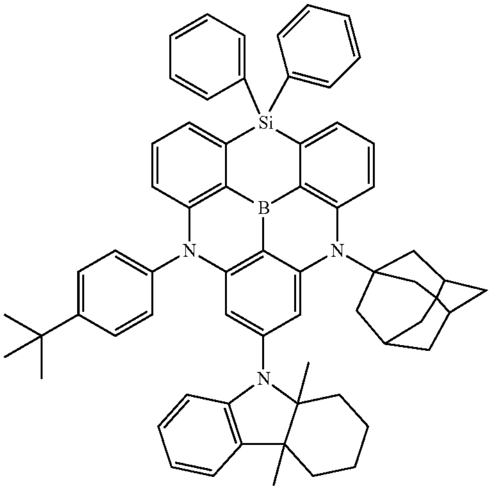

-continued
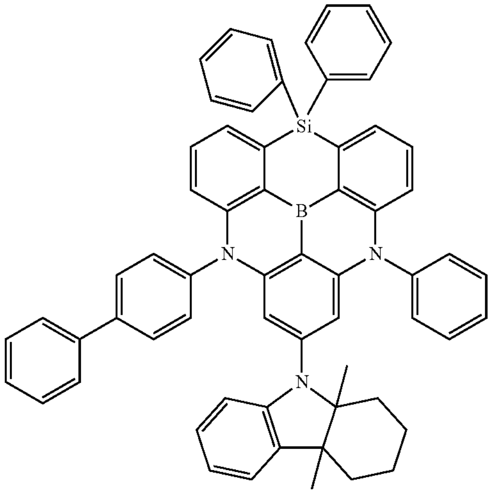
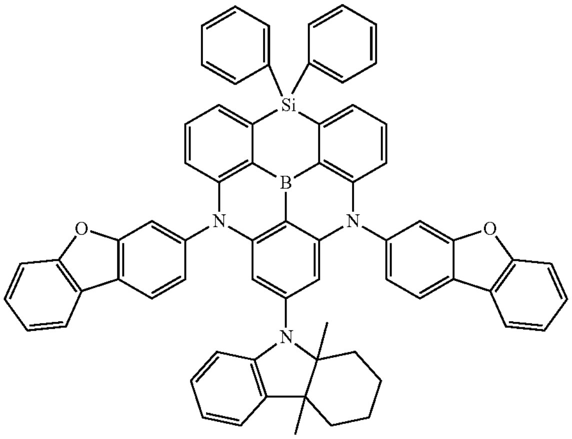
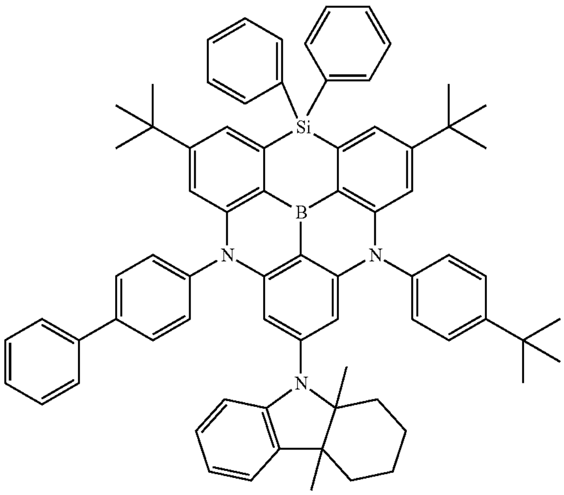
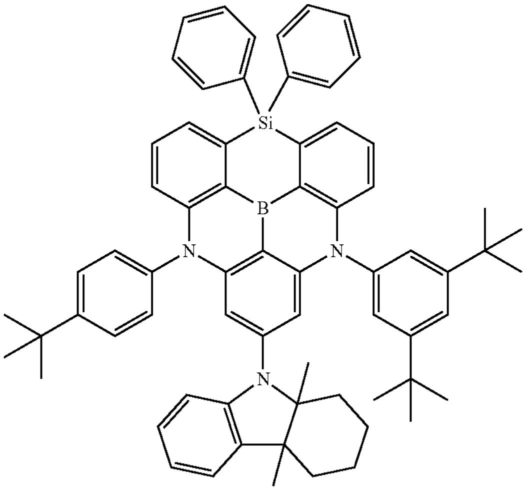
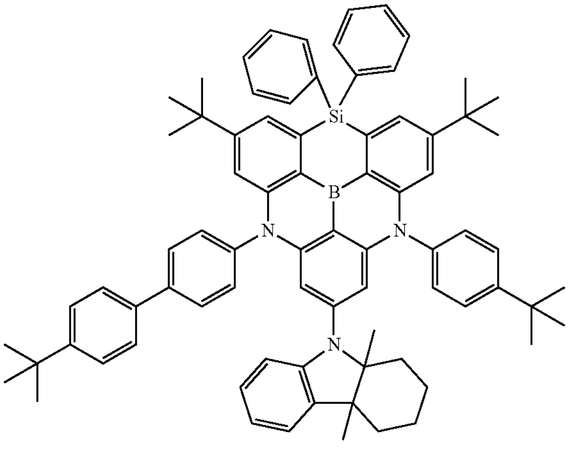
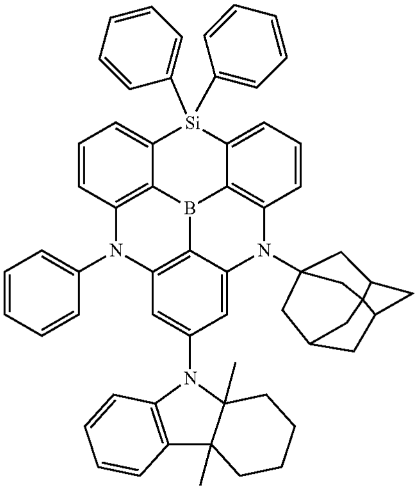
-continued -continued
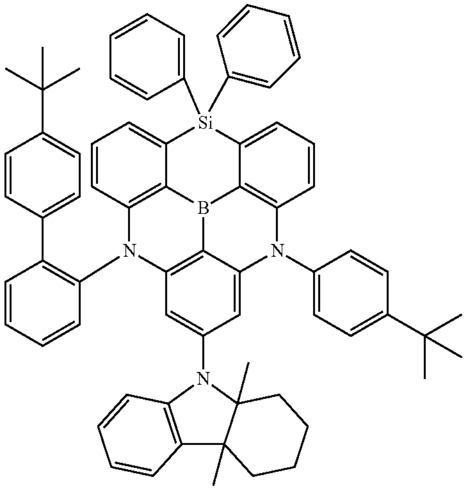 [SMILES: CC(C)(C)c1ccc(-c2ccccc2N2c3cc(N4c5ccccc5C5(C)CCCCC45C)cc4c3B3c5c(cccc5[Si](c5ccccc5)(c5ccccc5)c5cccc2c53)N4c2ccc(C(C)(C)C)cc2)cc1]
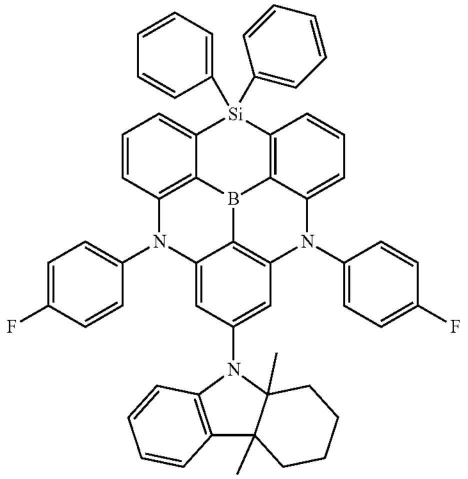
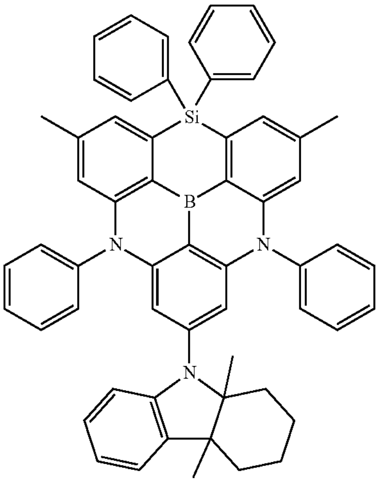
-continued
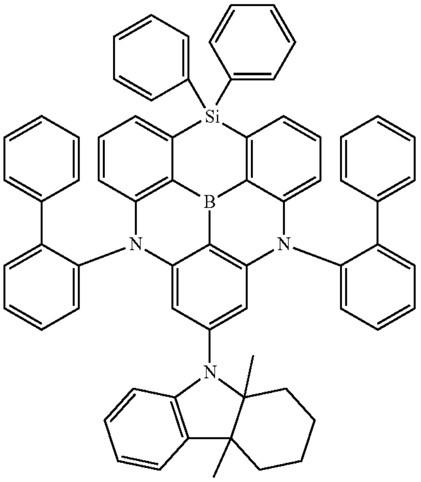
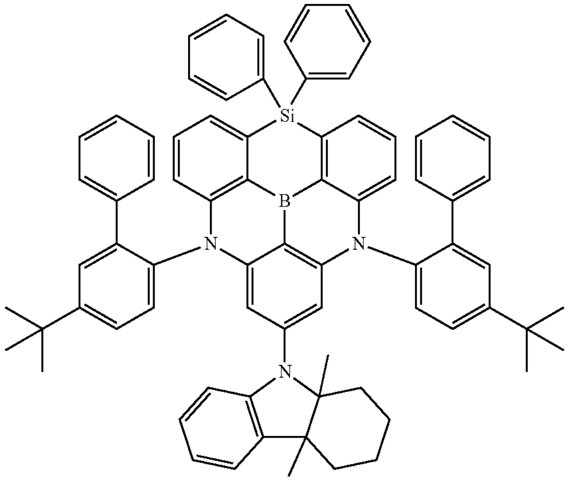
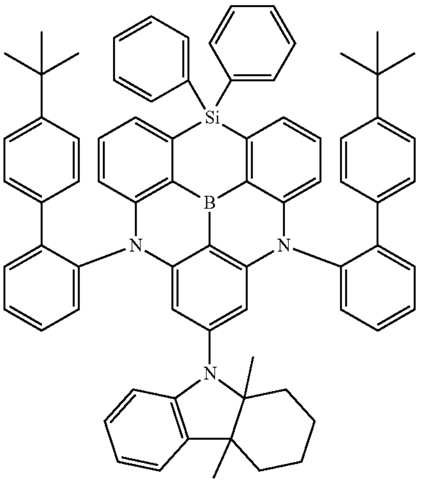

-continued
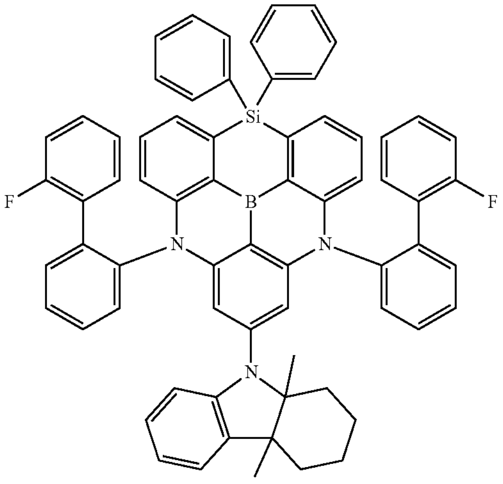
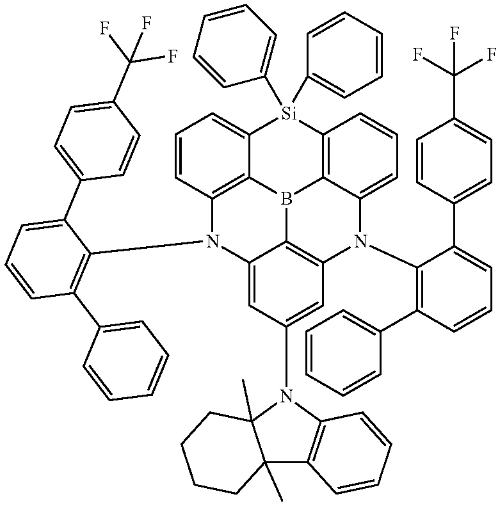
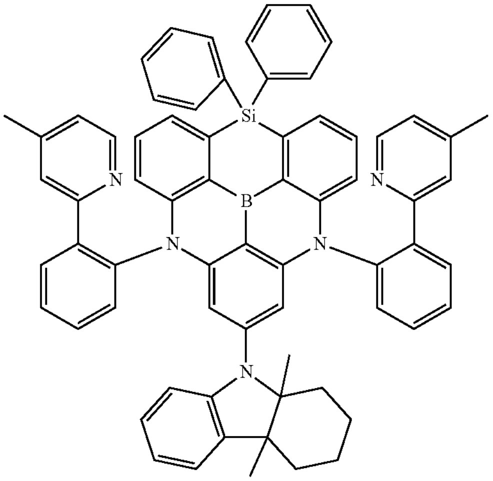
-continued
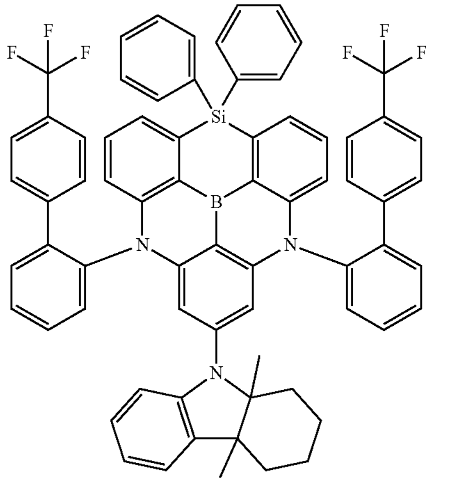
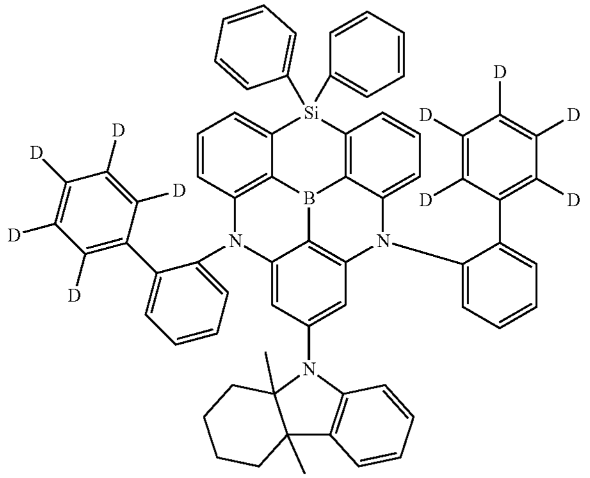
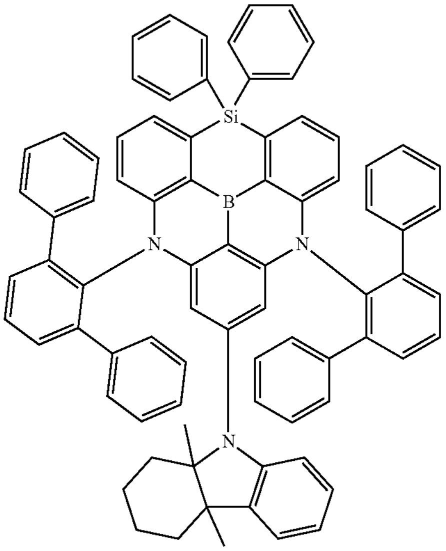

-continued
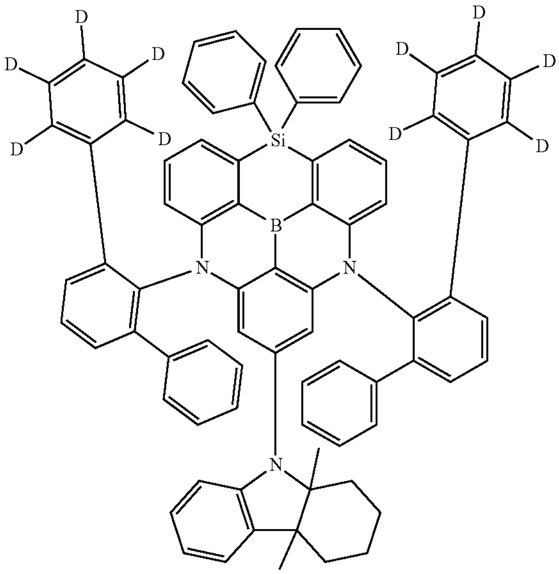
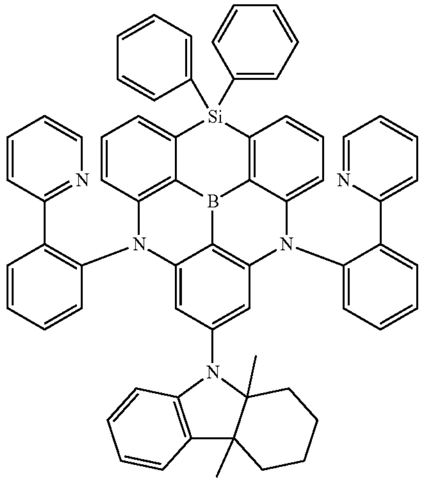
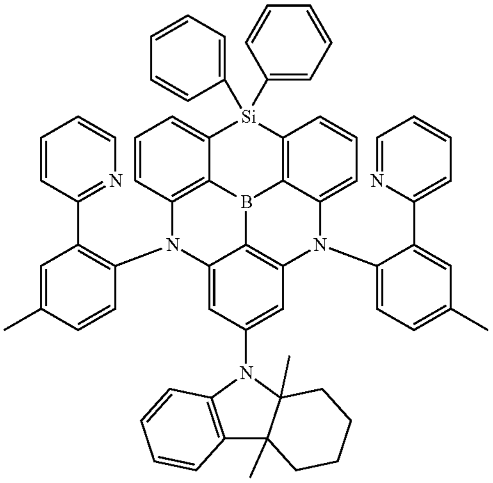
-continued
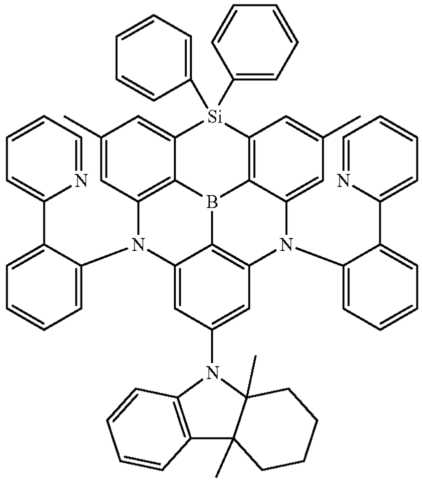
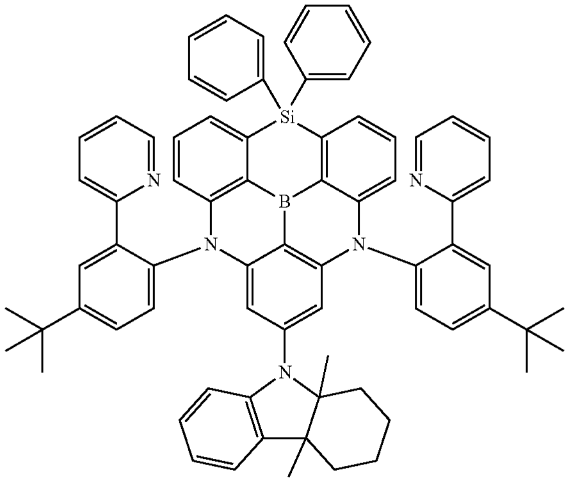
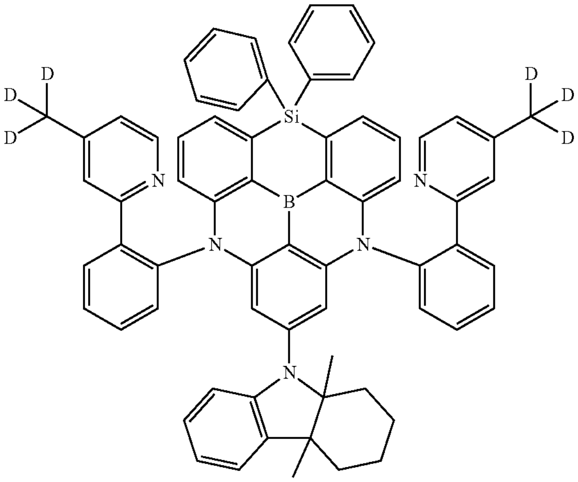

-continued
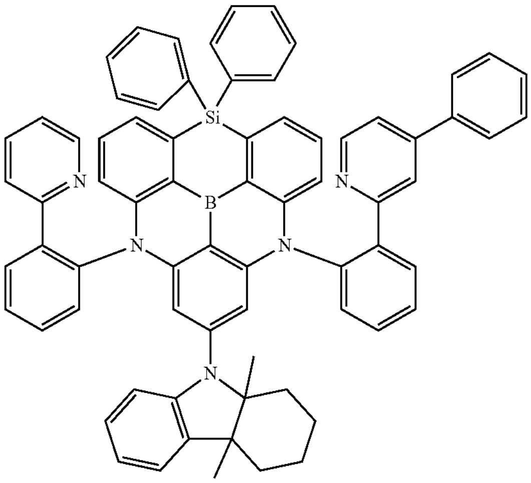
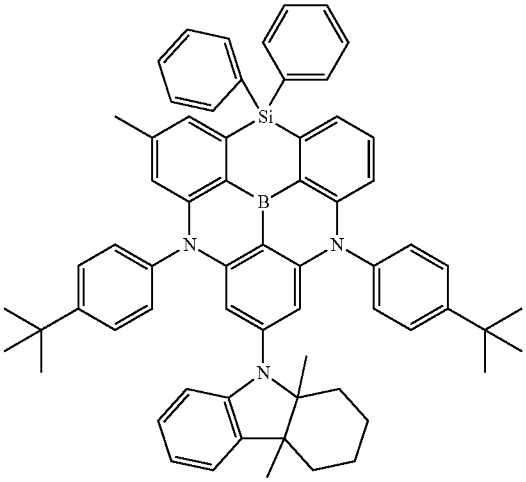
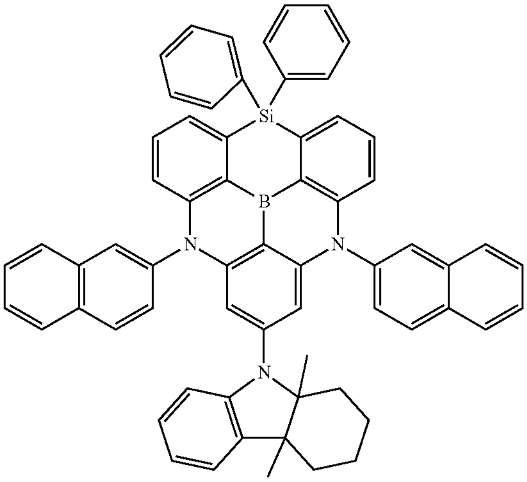
-continued
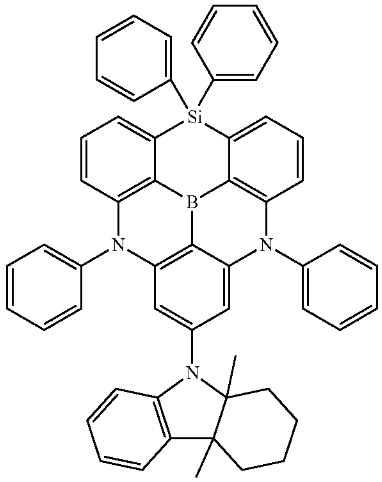
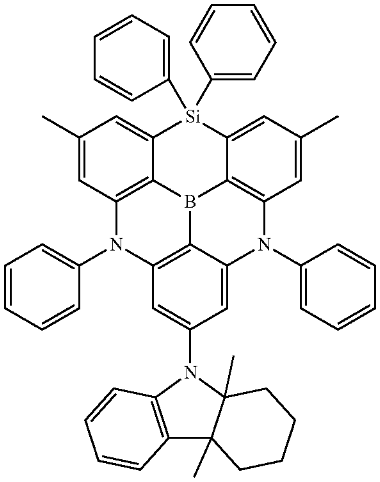
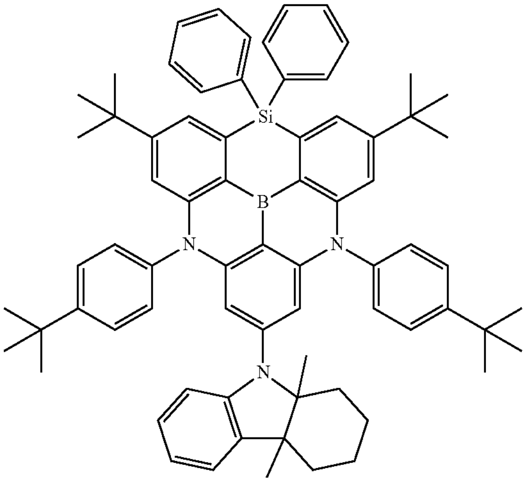

-continued
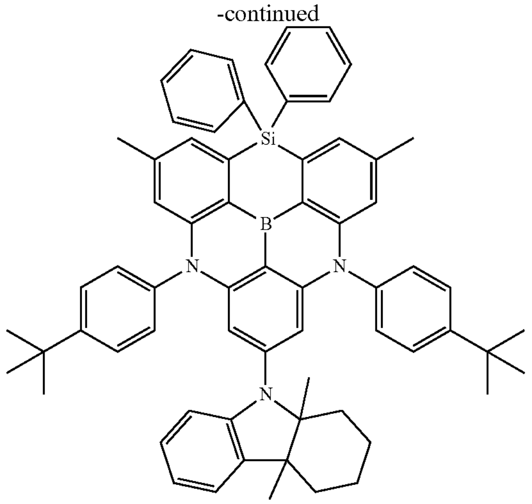
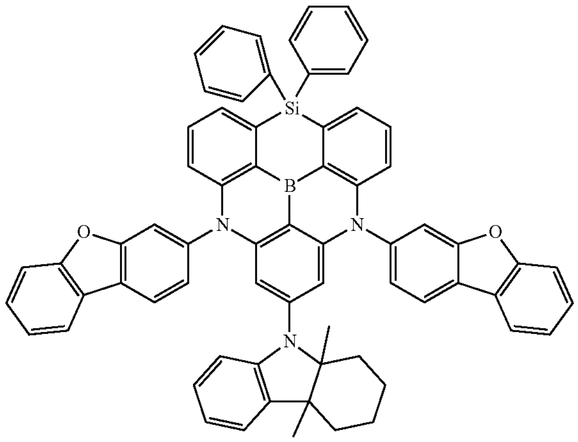
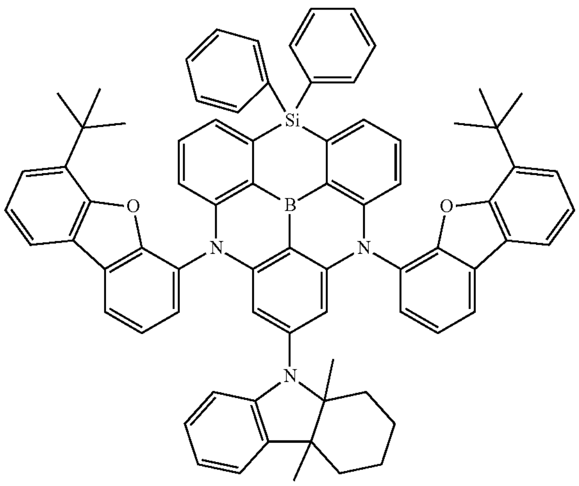
-continued
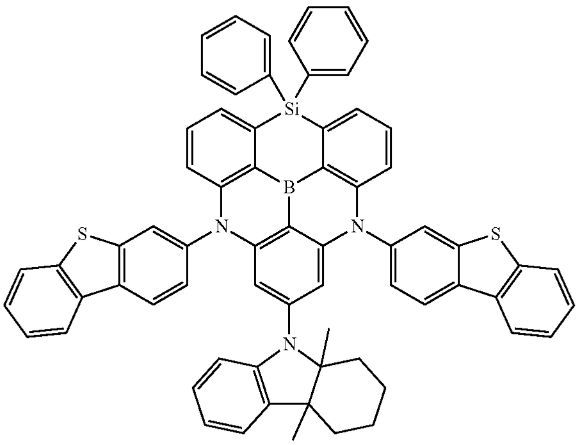
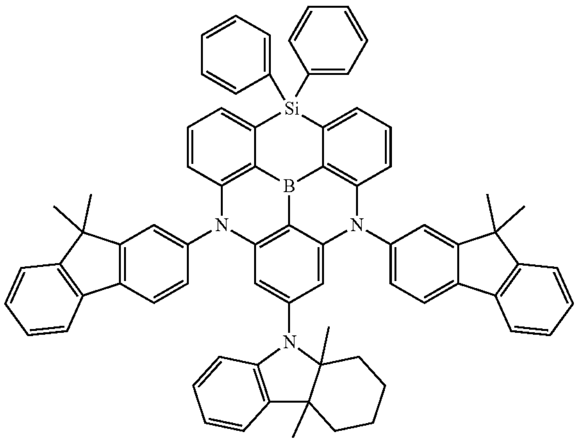
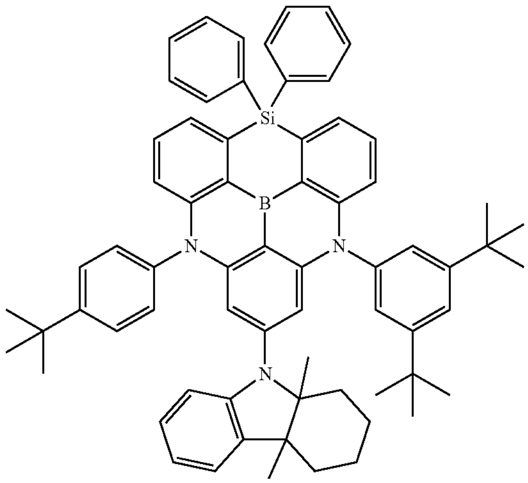

-continued
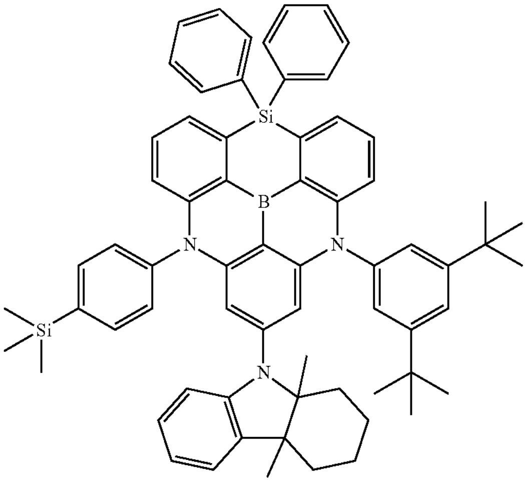
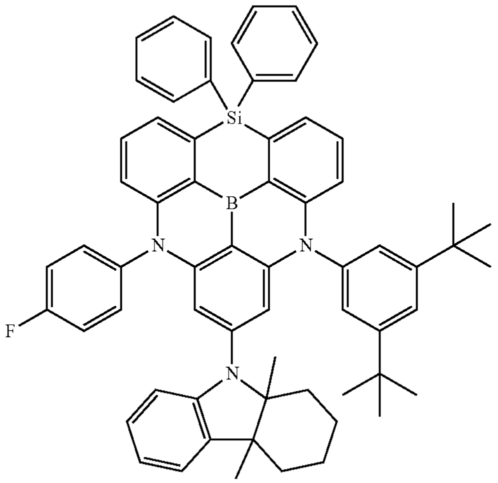
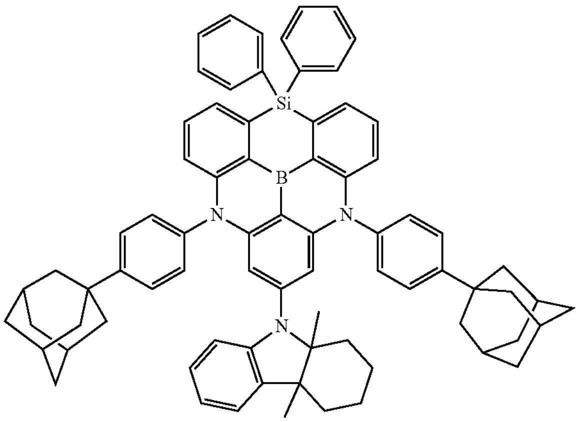
-continued
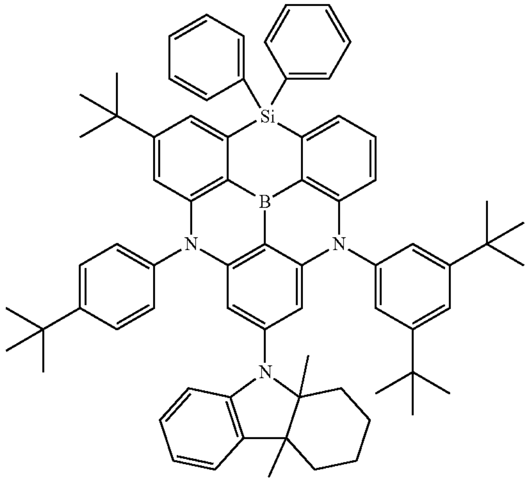
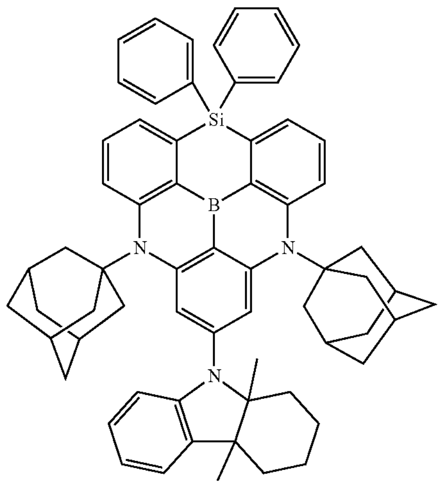
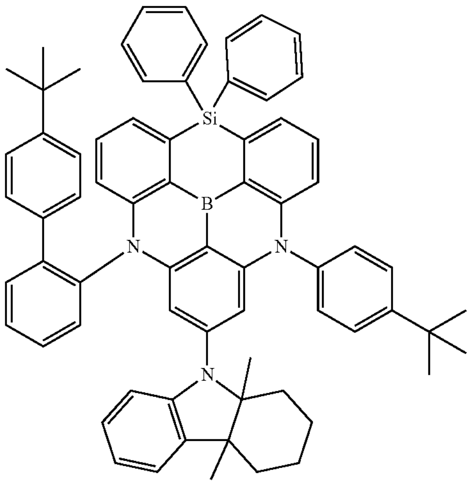

-continued
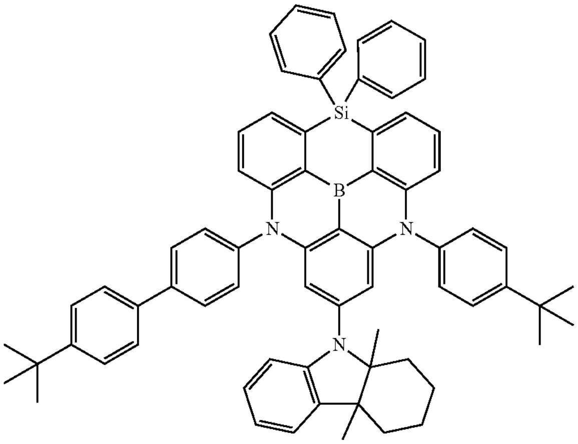
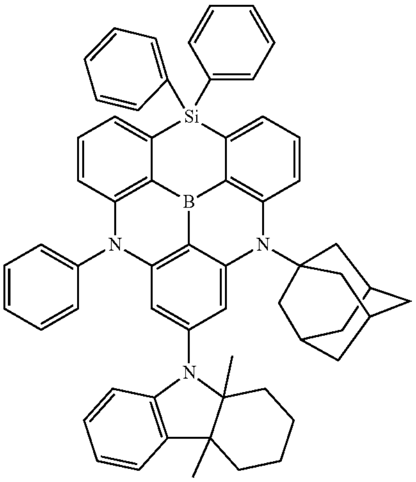
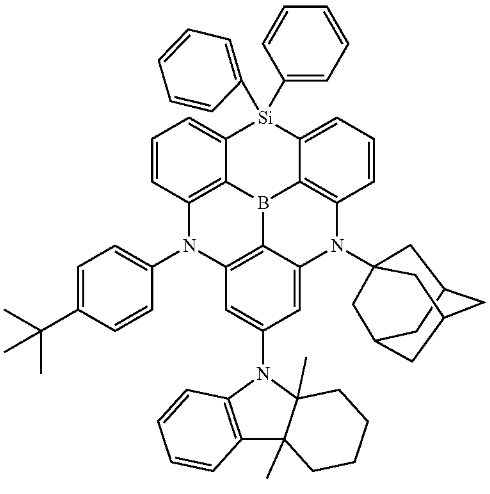
-continued
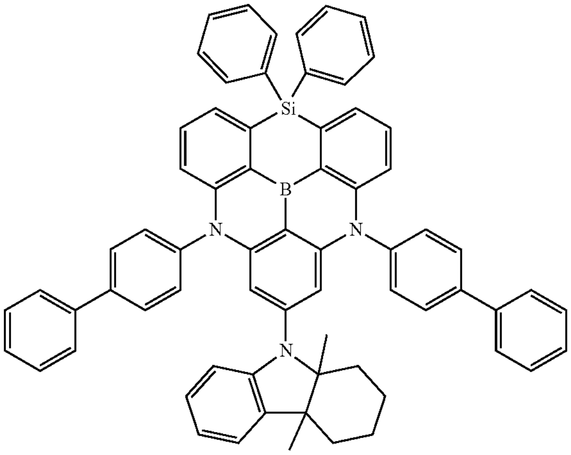
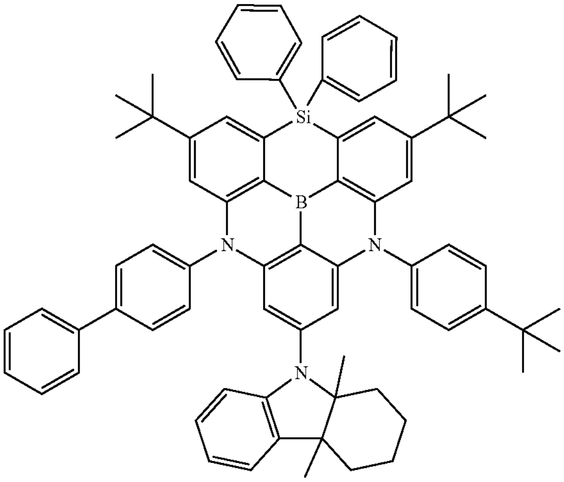
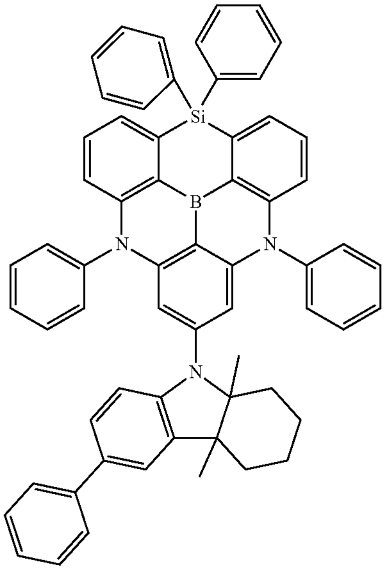

-continued
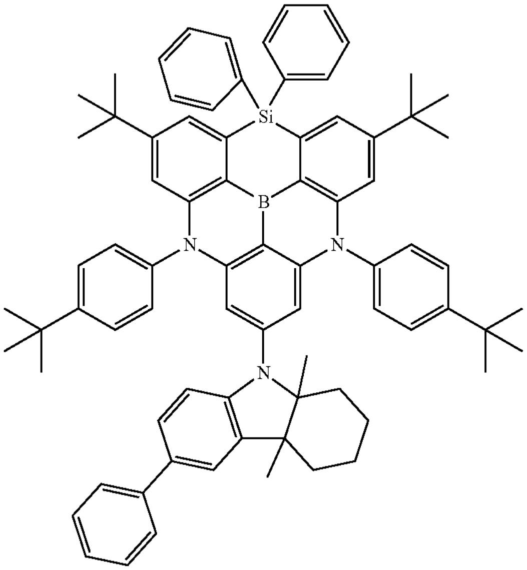
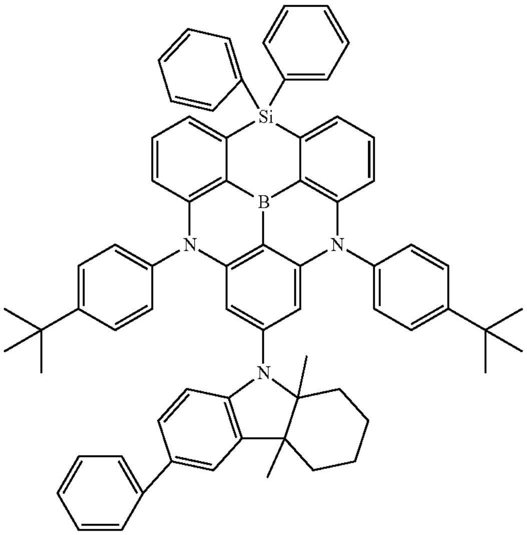
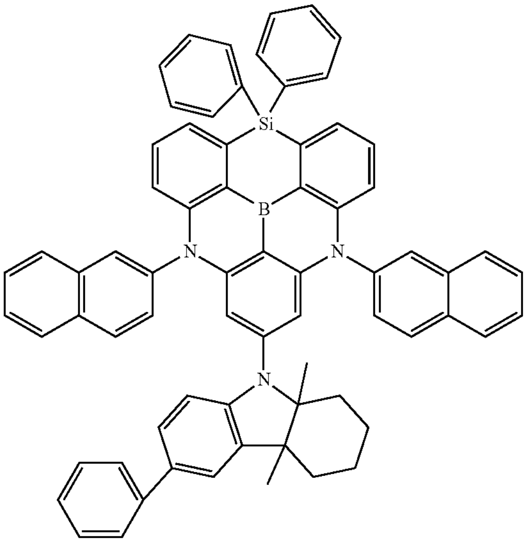
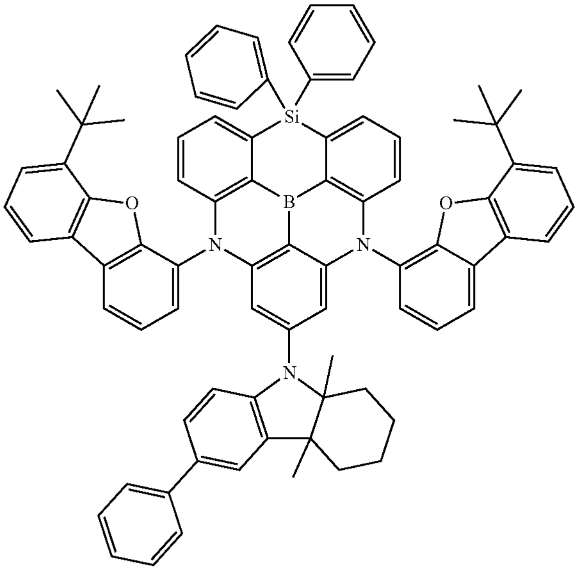
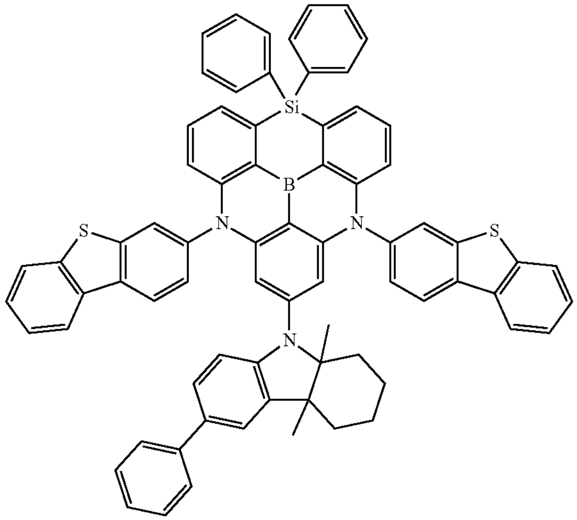
-continued
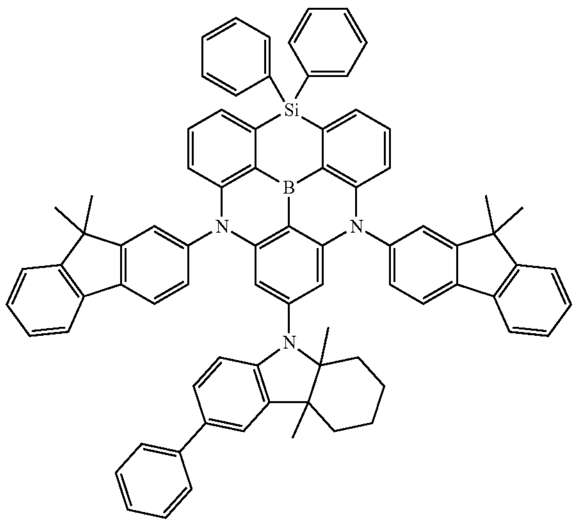

-continued
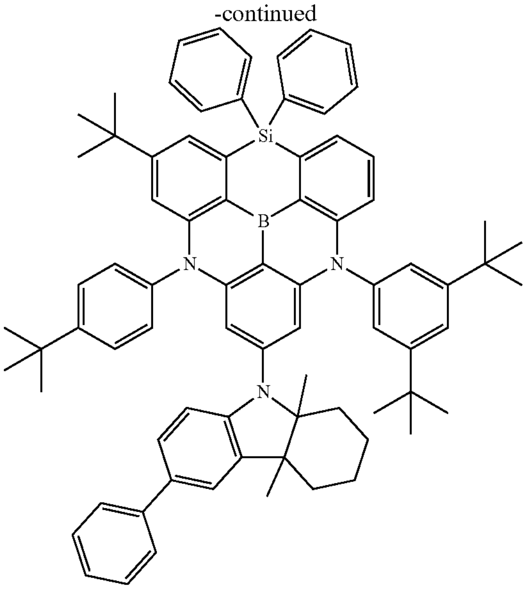
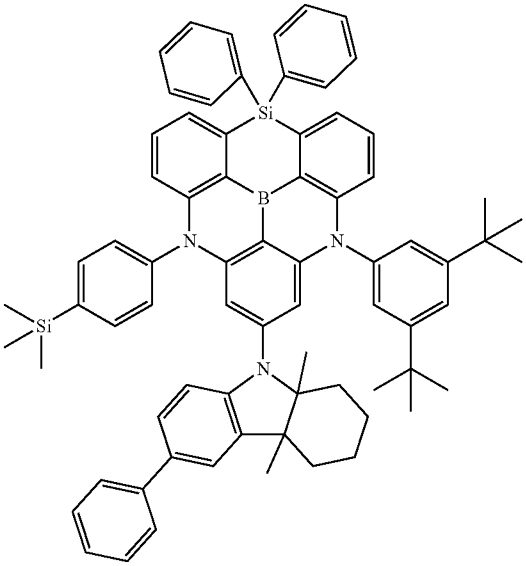
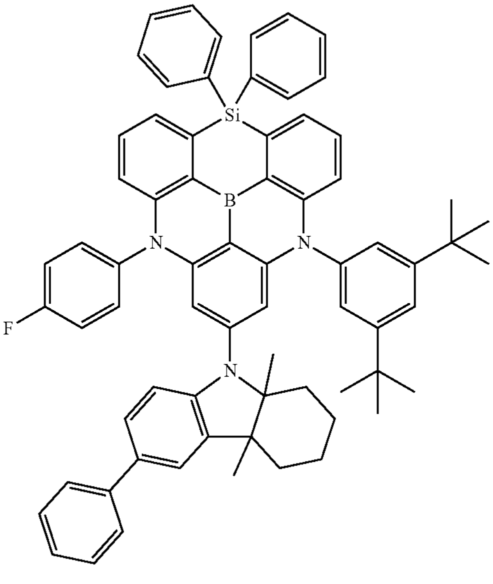
-continued
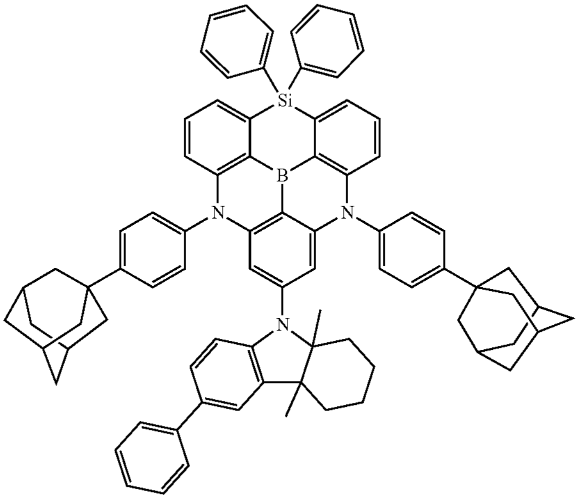
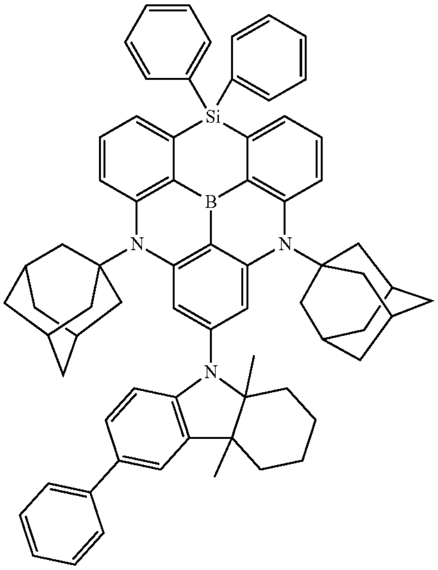
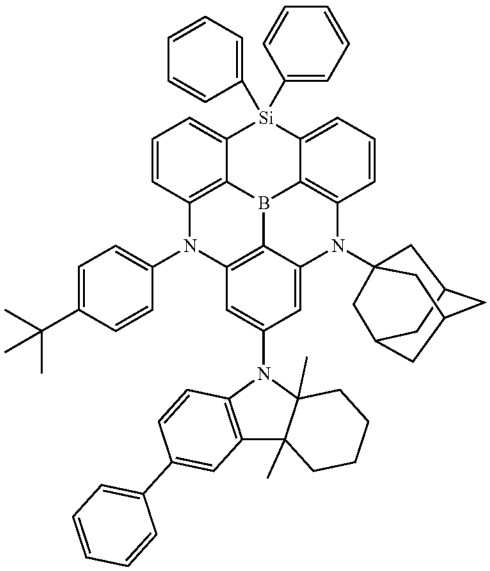

-continued
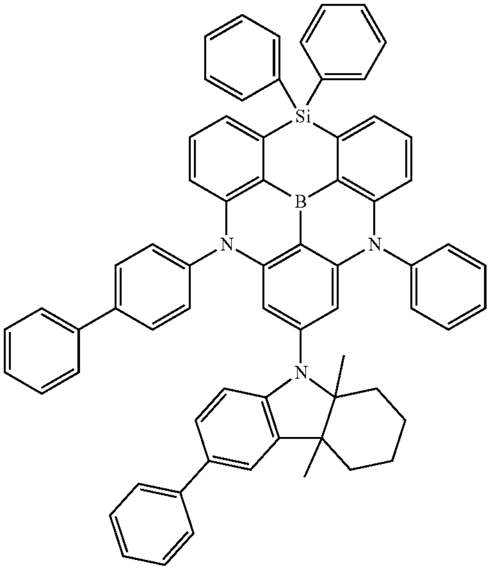
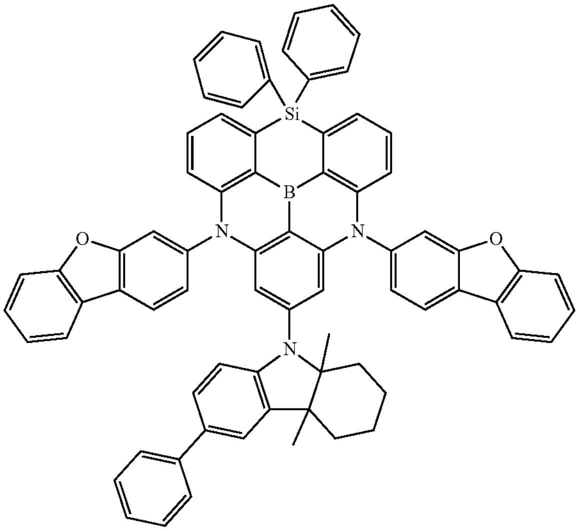
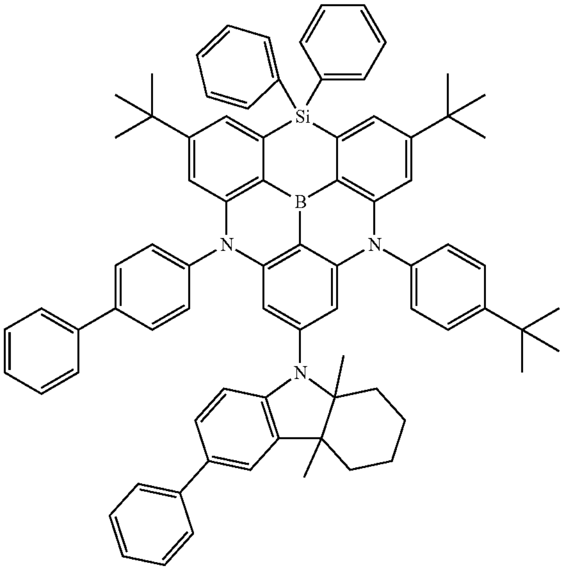
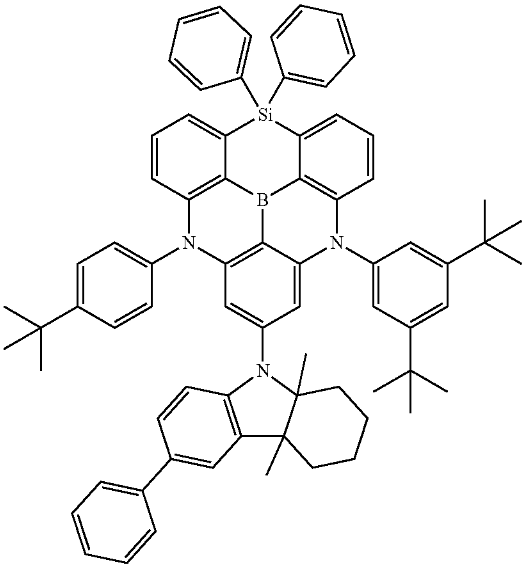
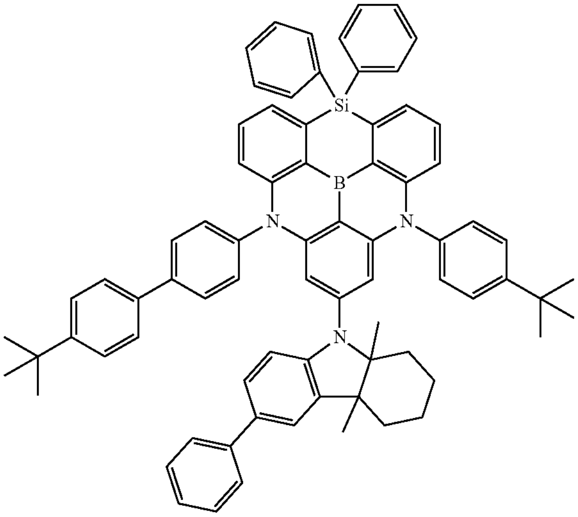
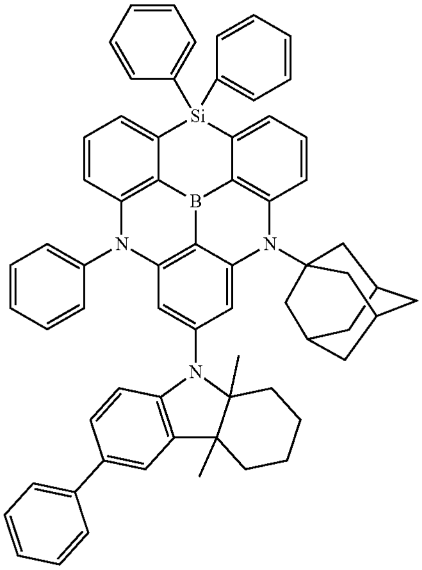

-continued
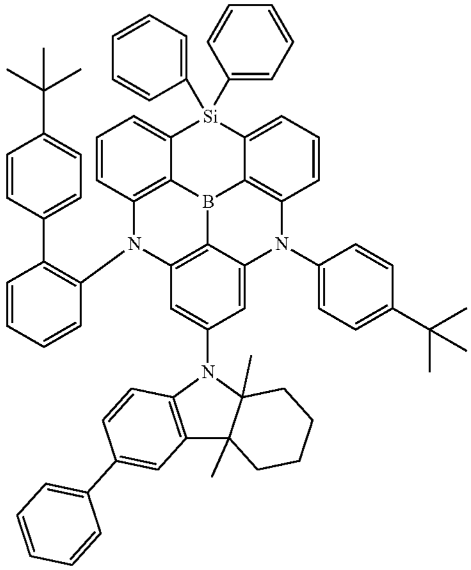
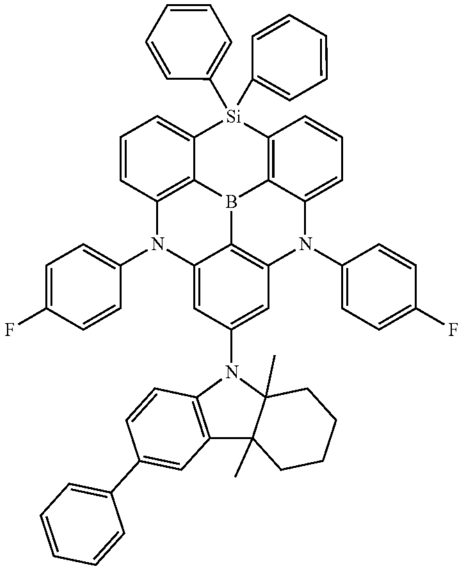
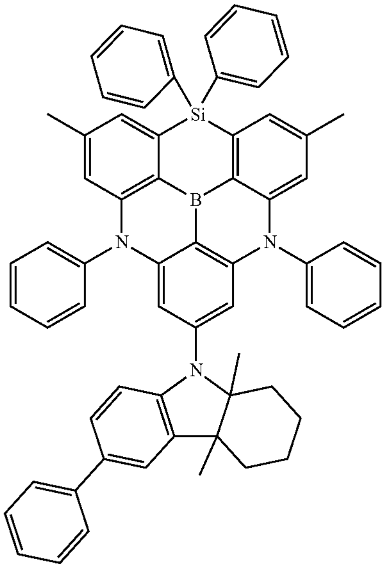
-continued
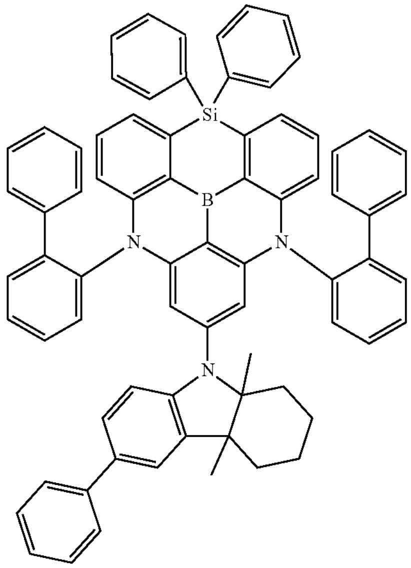
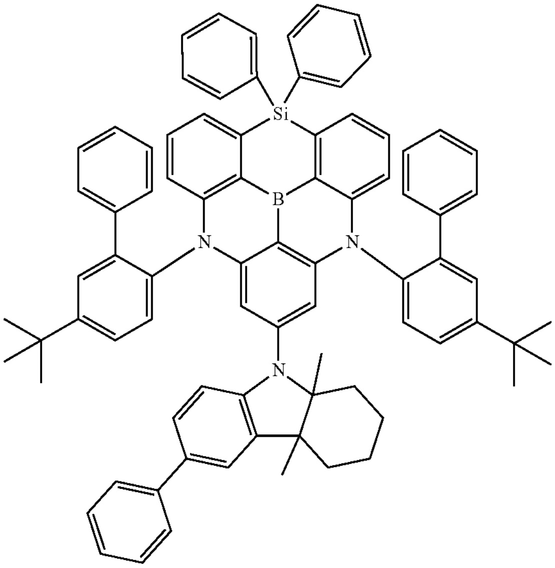
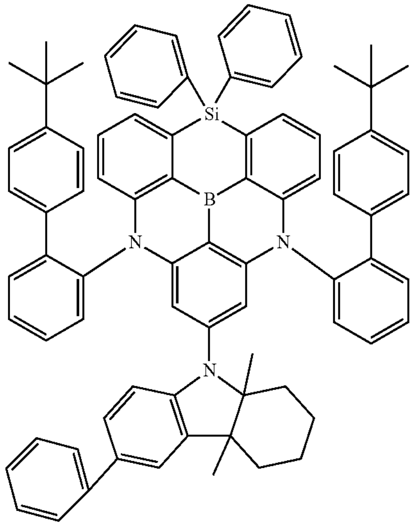

-continued
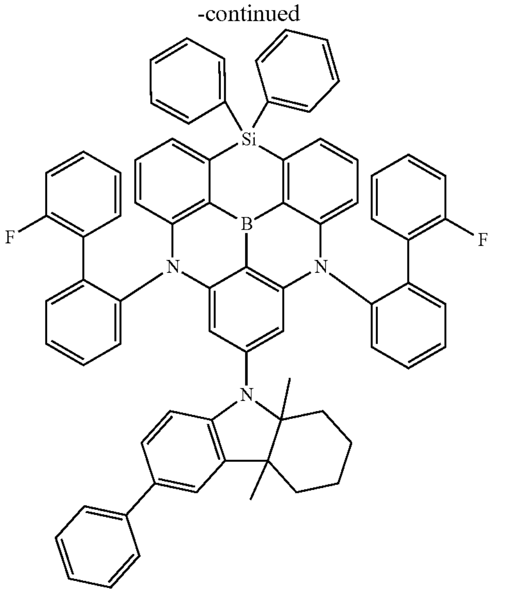
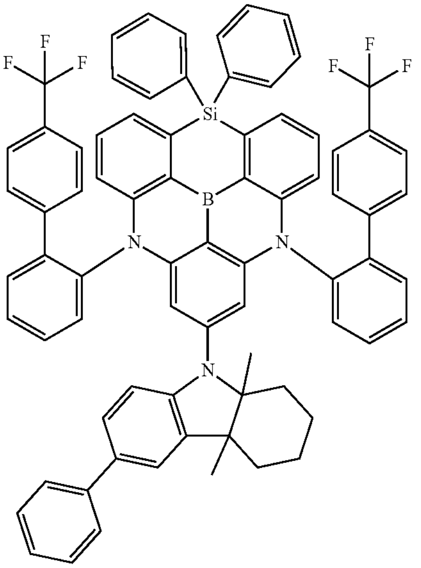
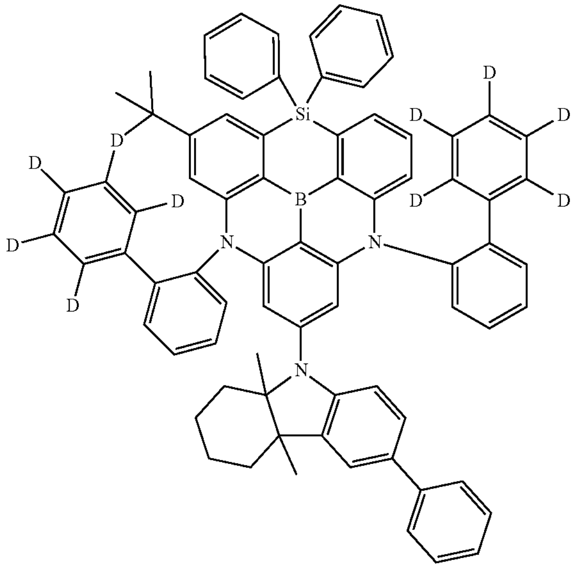
-continued
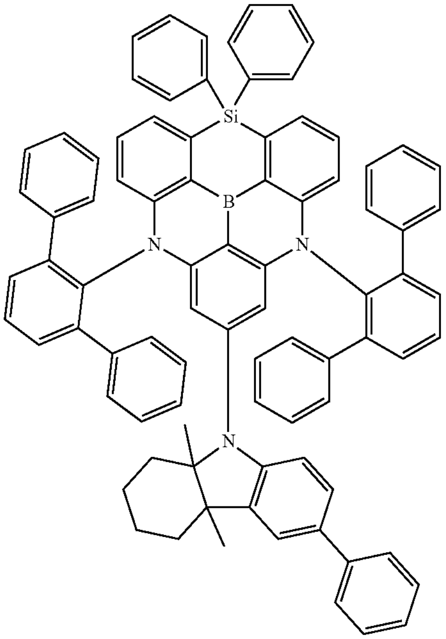
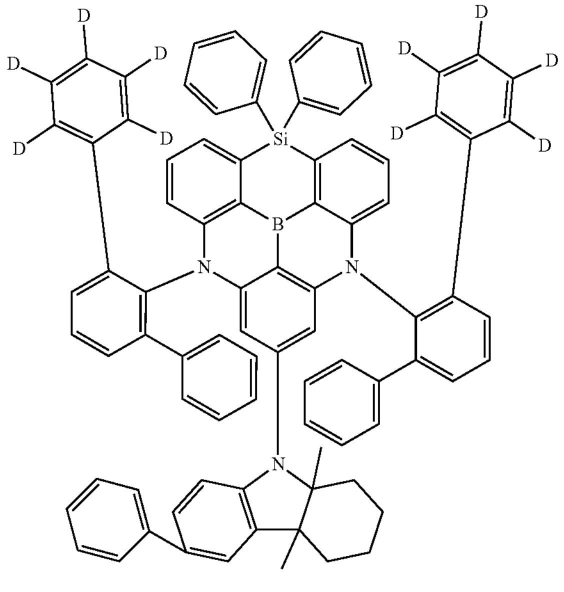

-continued
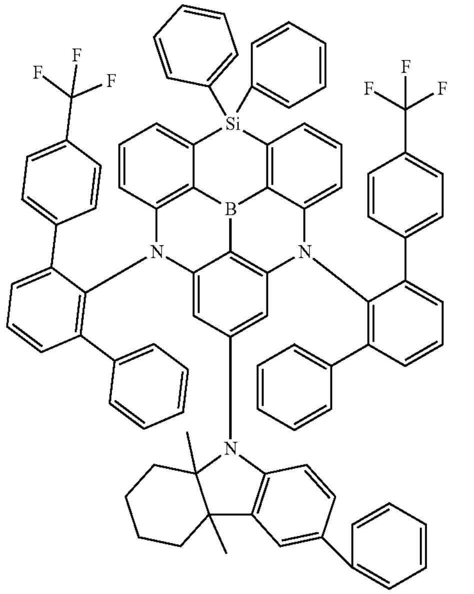
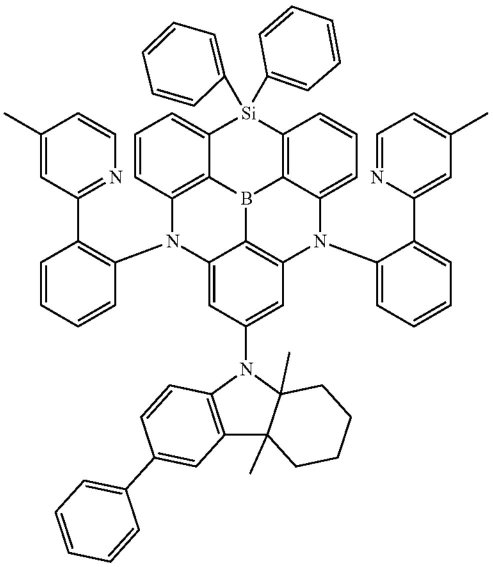
-continued
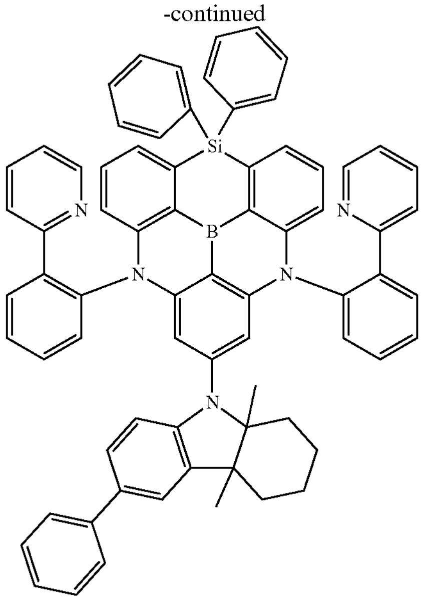
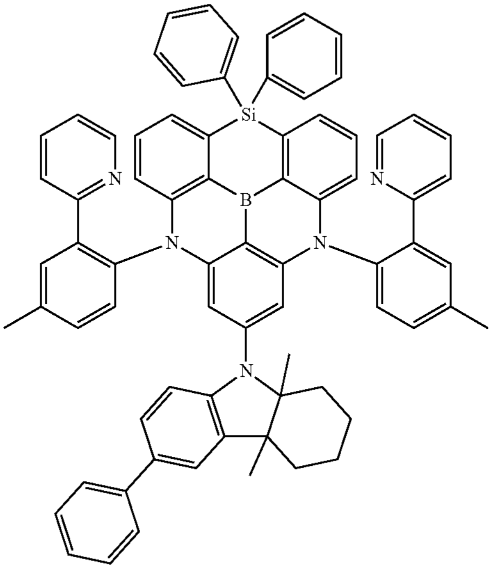
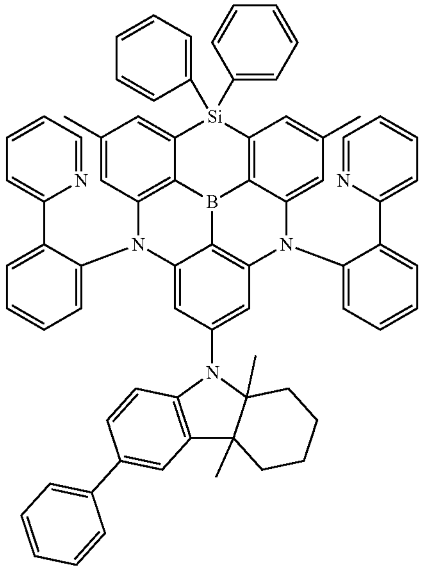

-continued
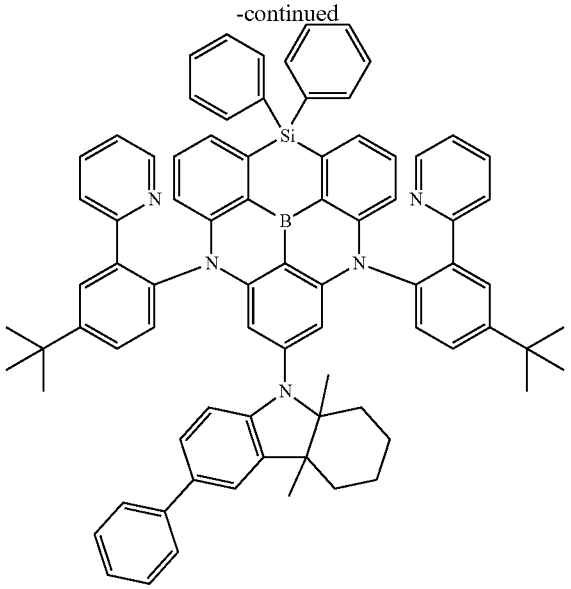
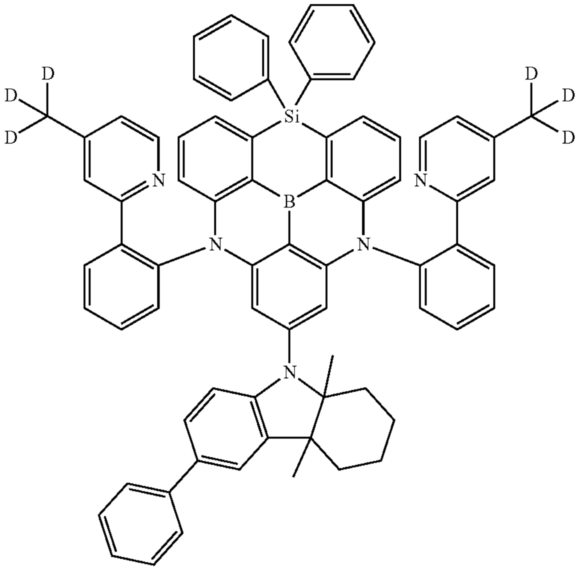
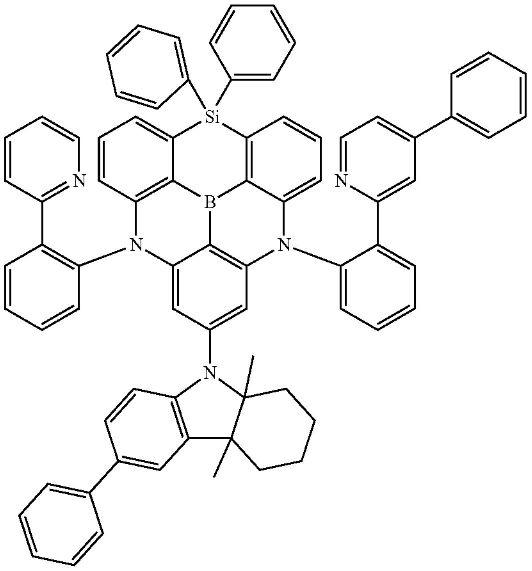
-continued
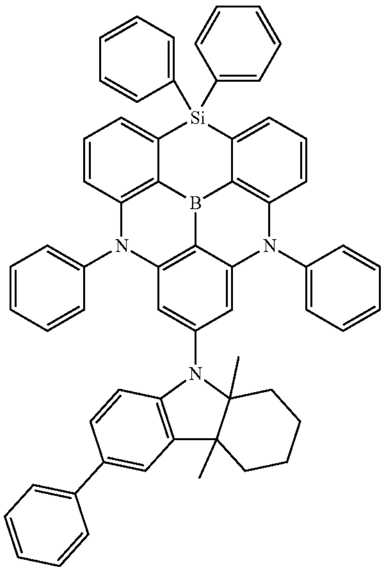
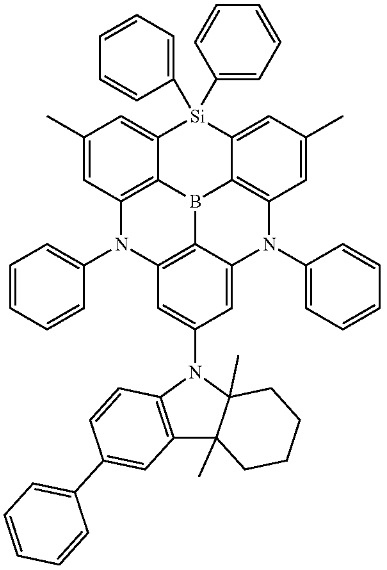
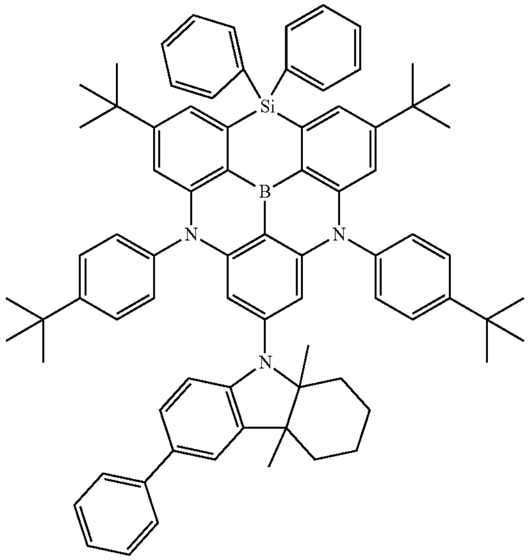

-continued
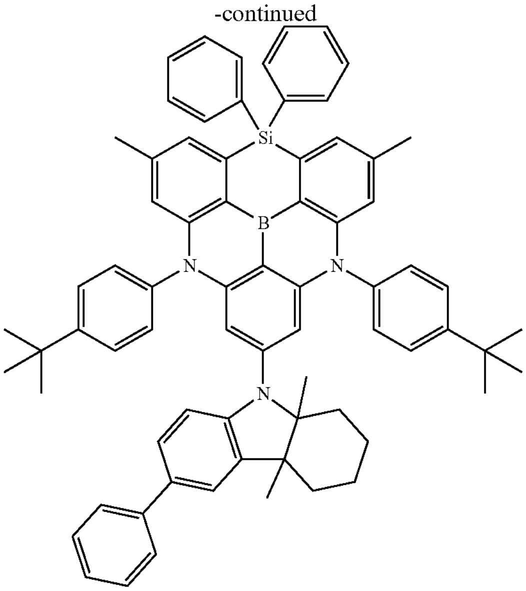
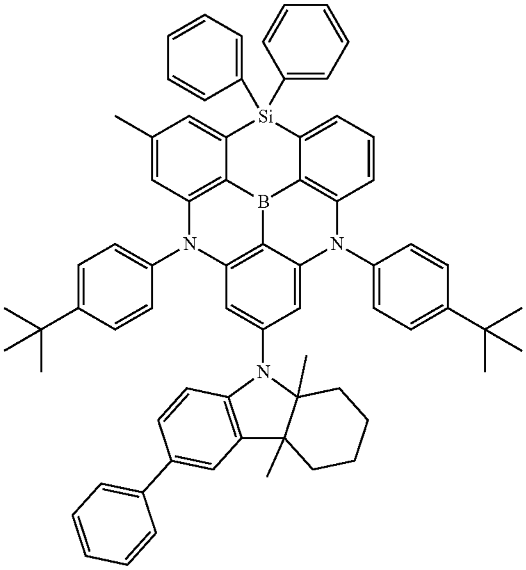
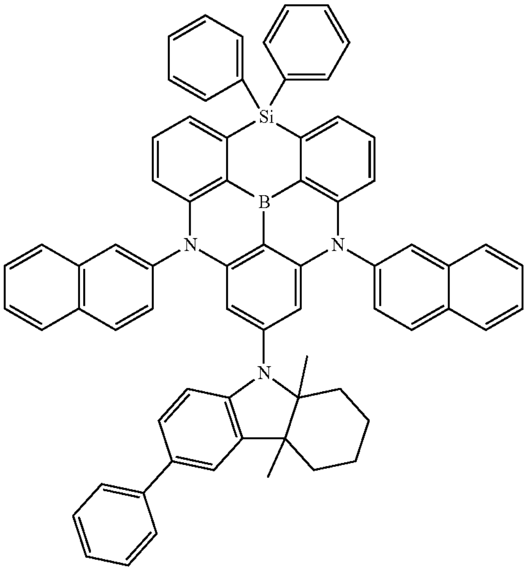
-continued
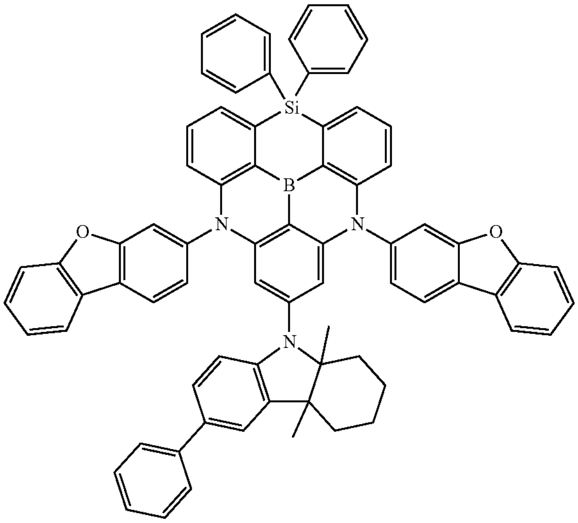
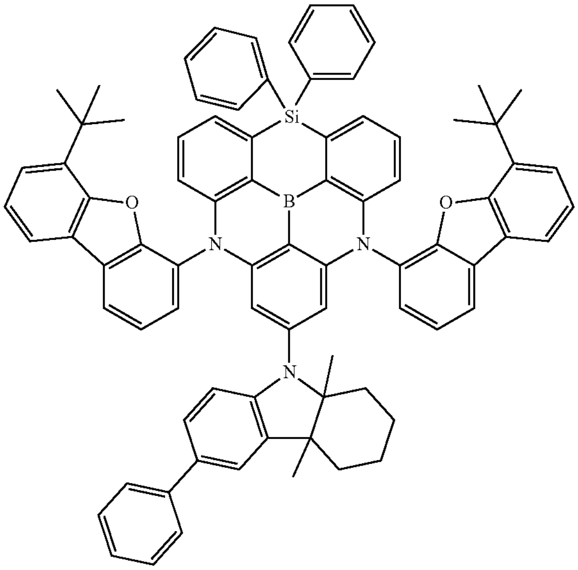
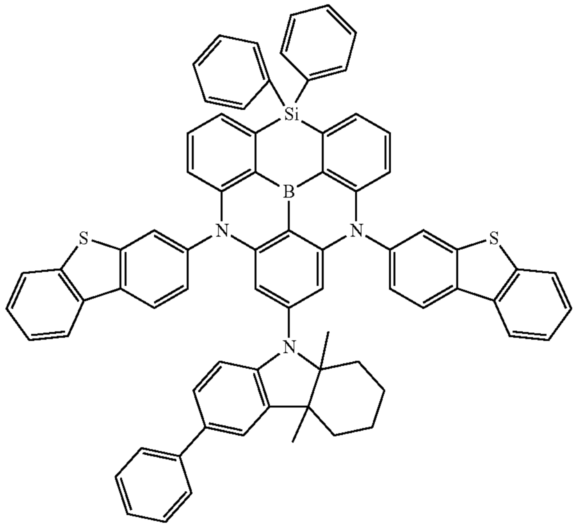

-continued
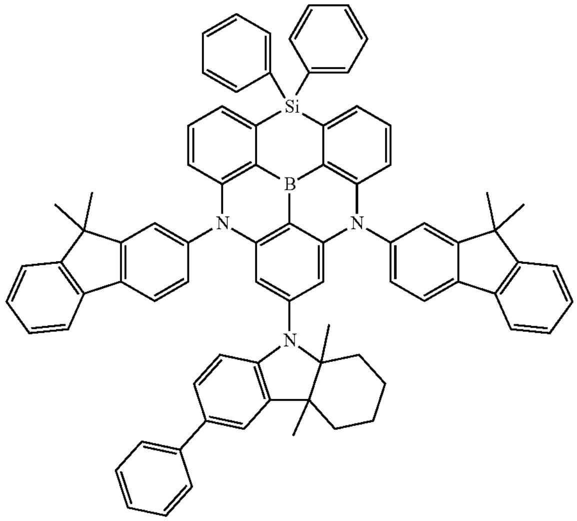
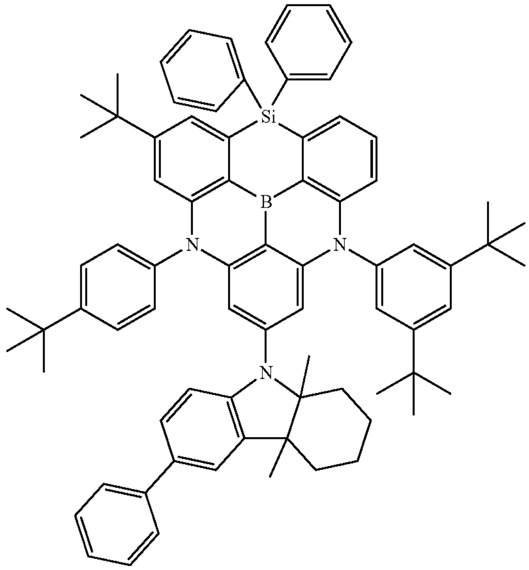
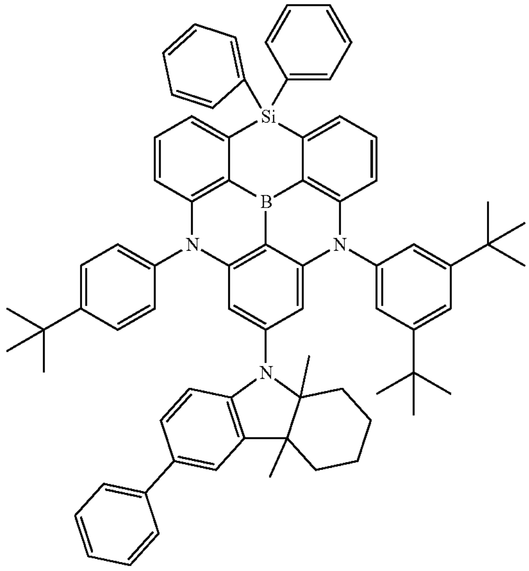
-continued
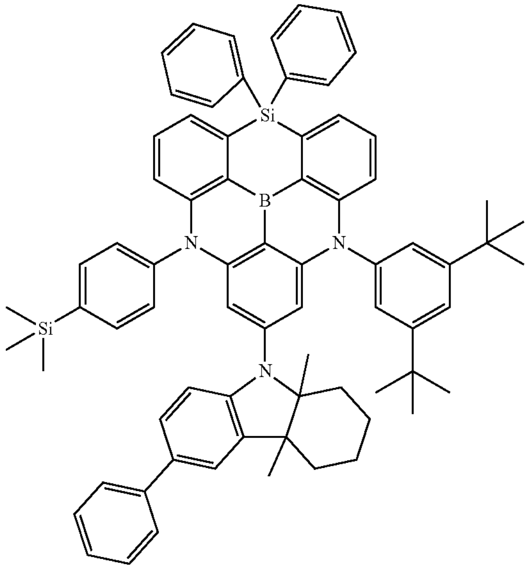
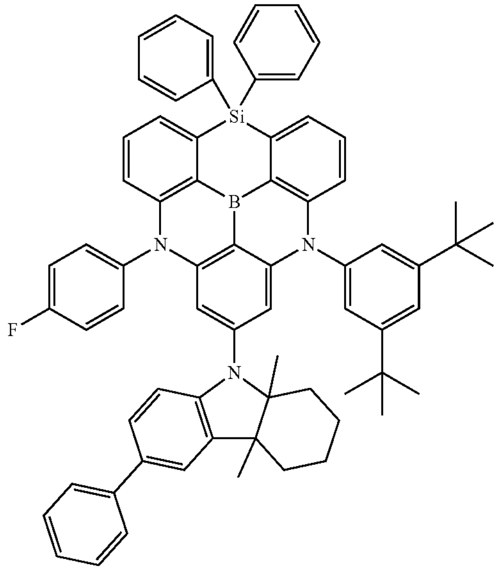
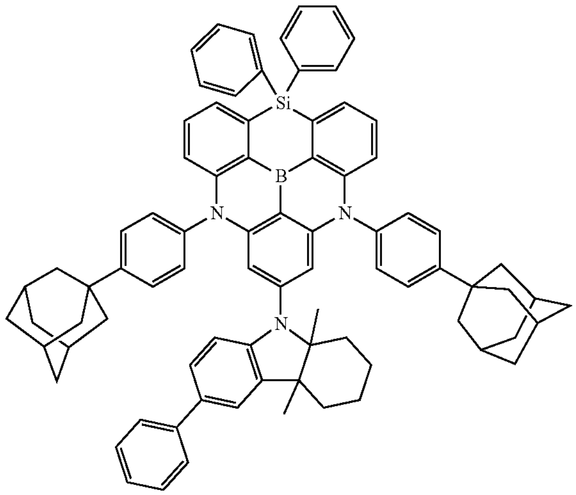

-continued
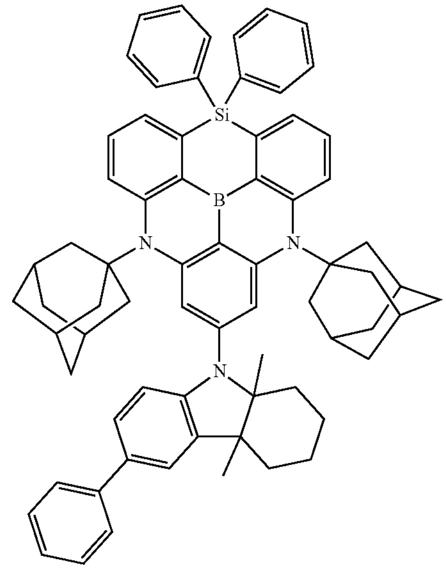
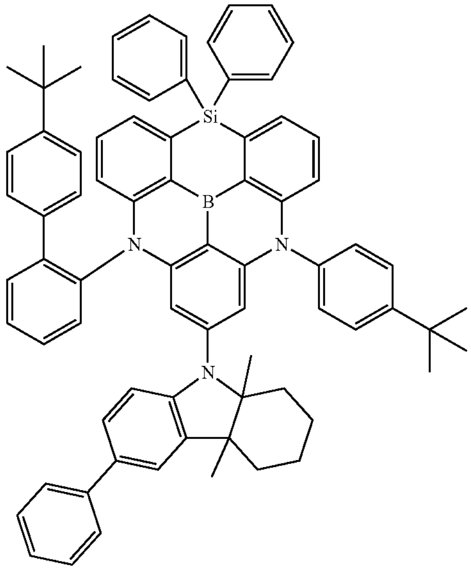
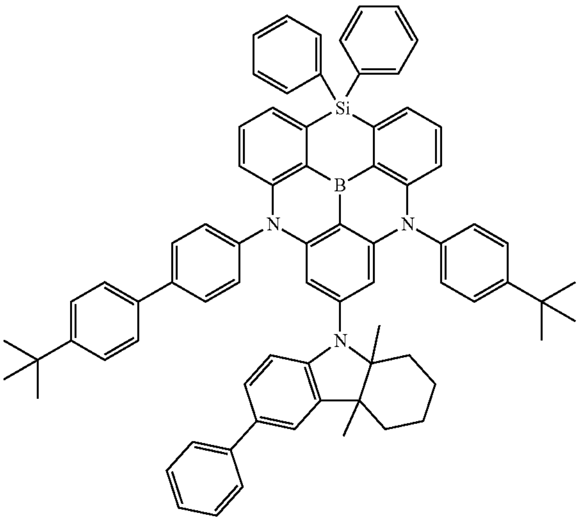
-continued
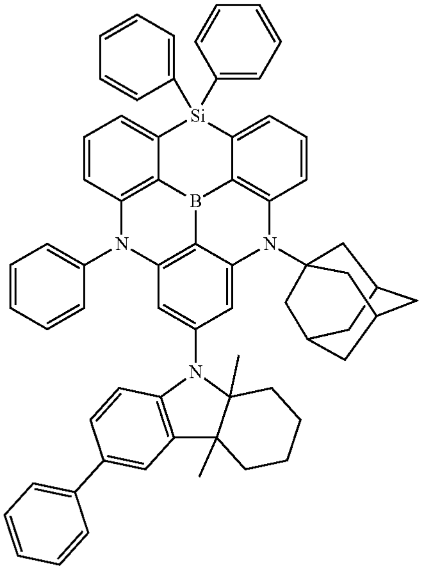
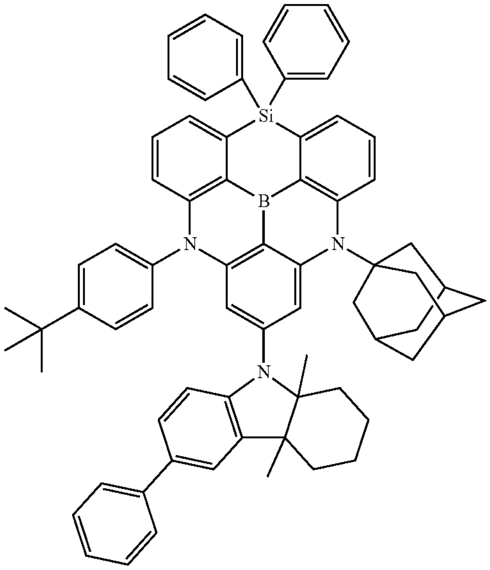
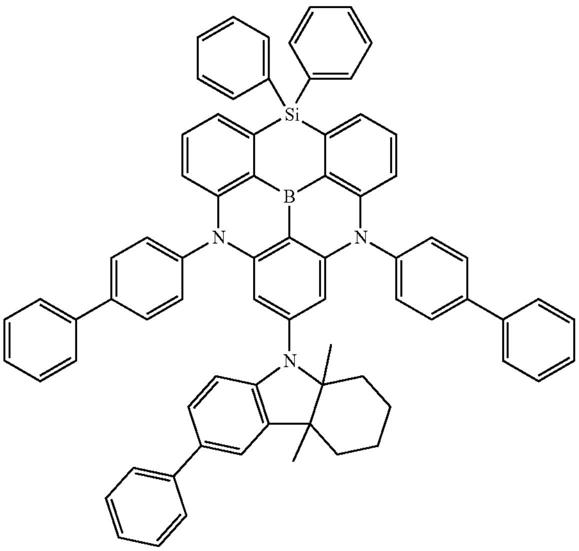

-continued
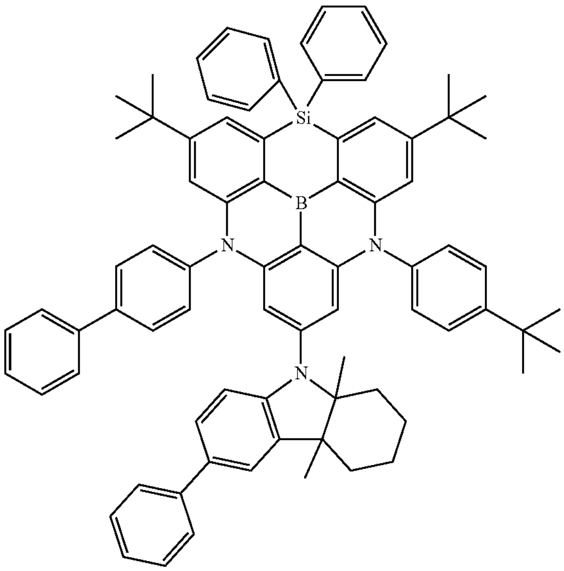
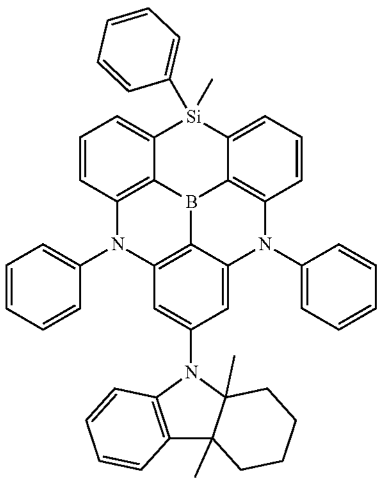
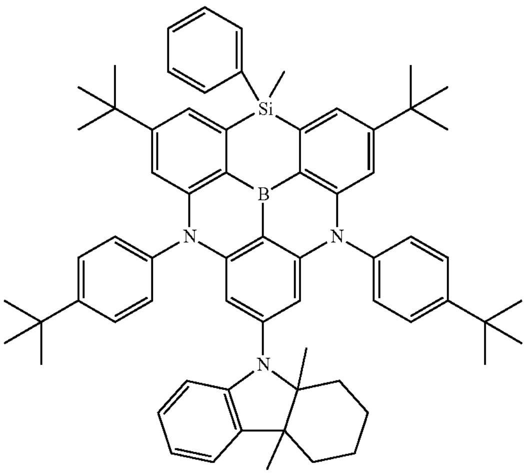
-continued
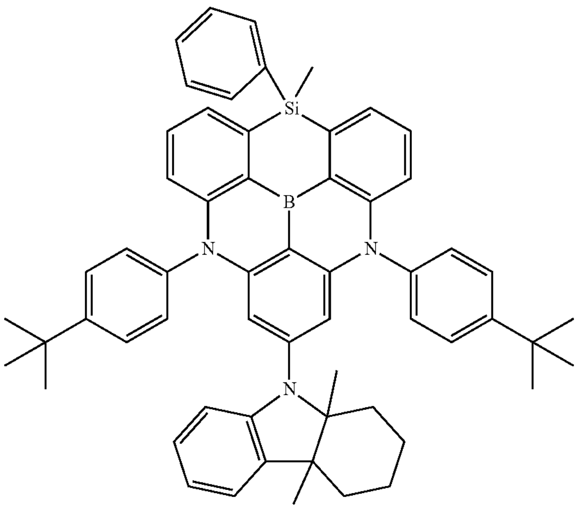
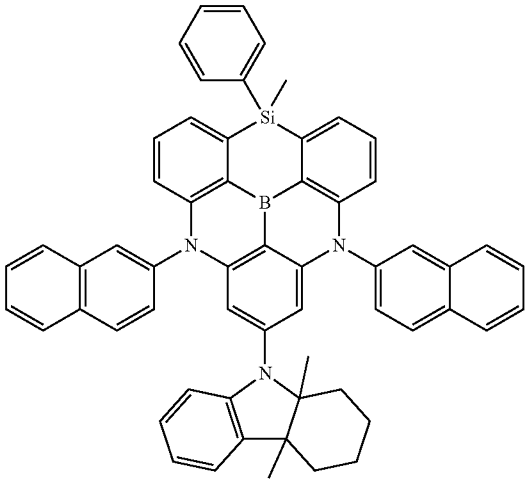
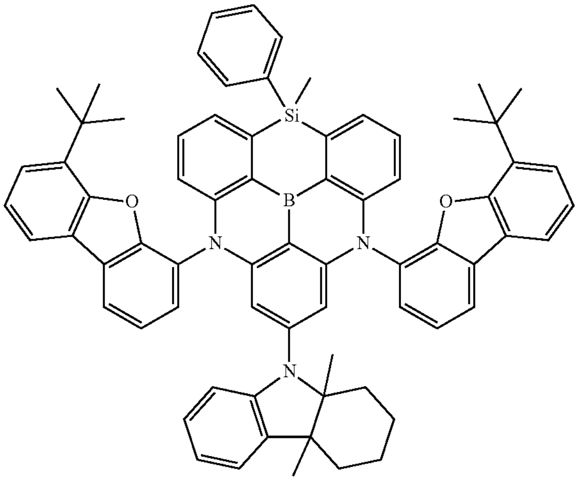

-continued
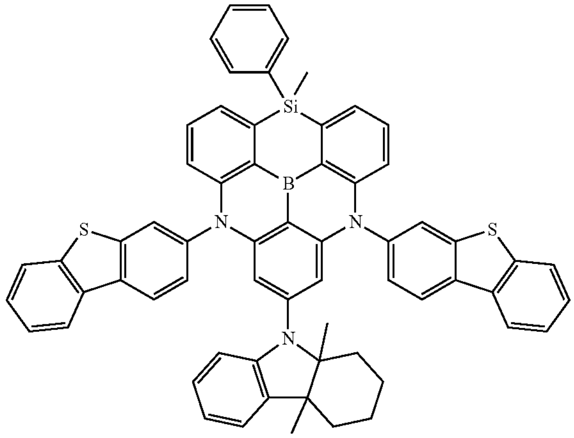
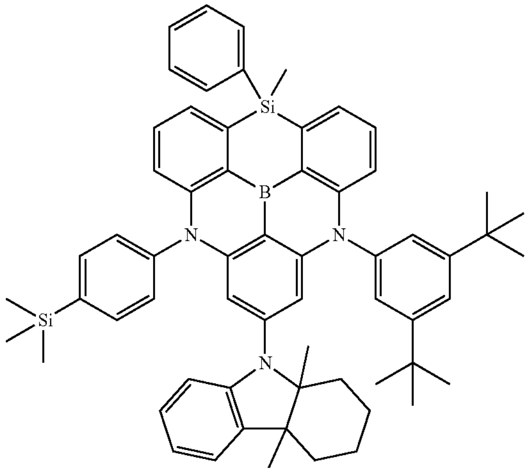
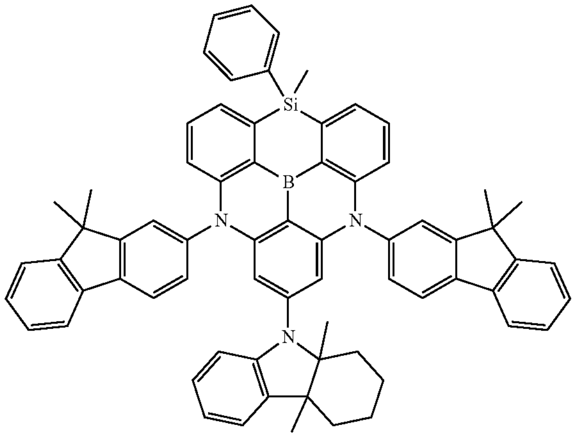
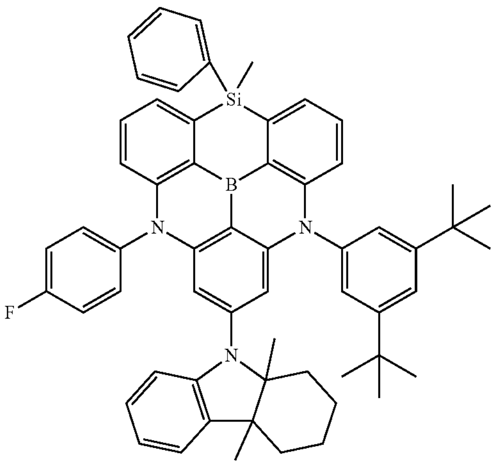
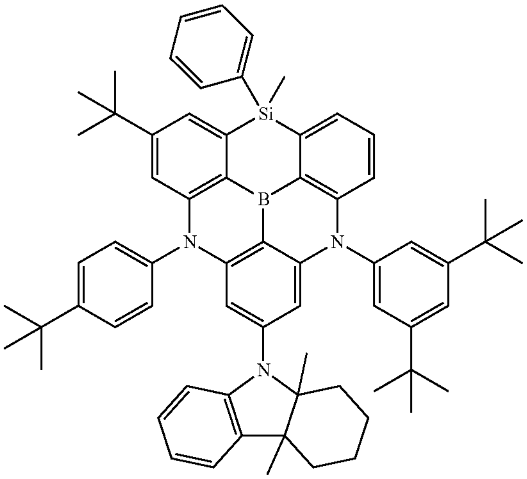
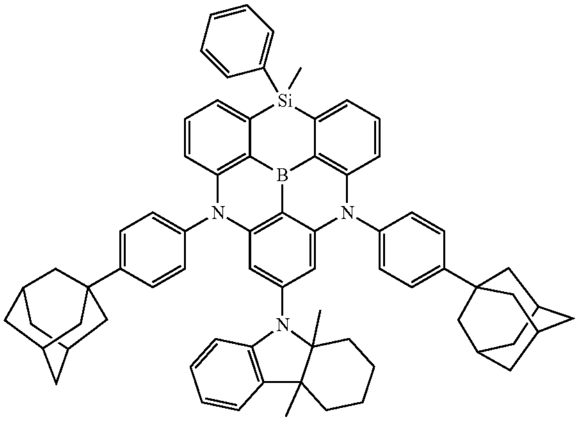
-continued -continued
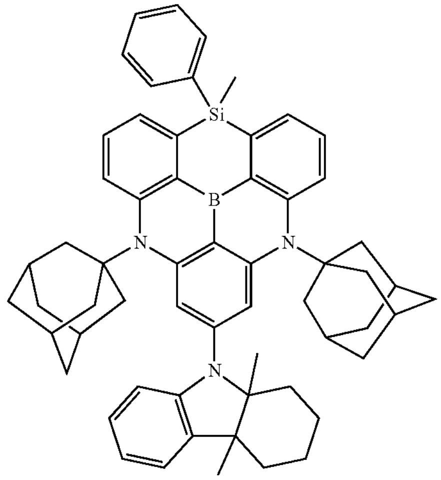
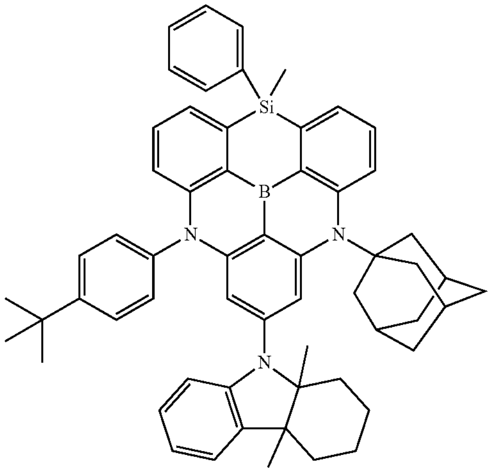
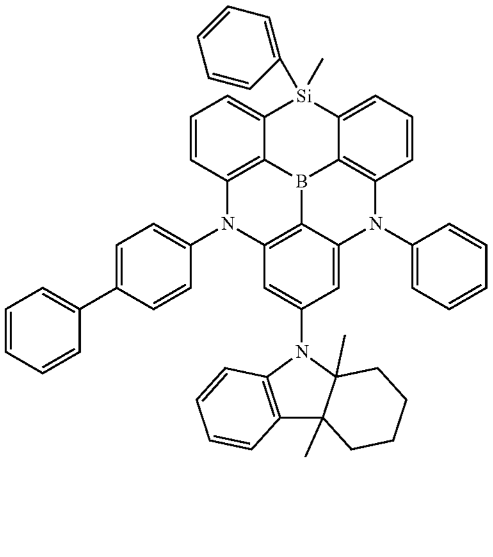
-continued
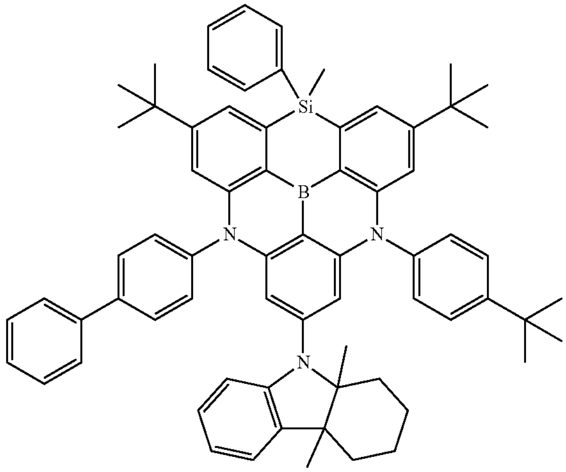
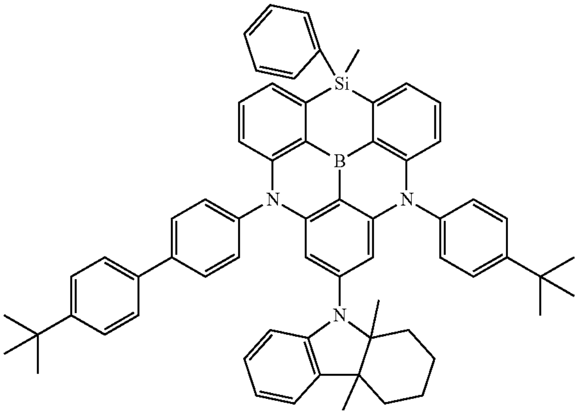
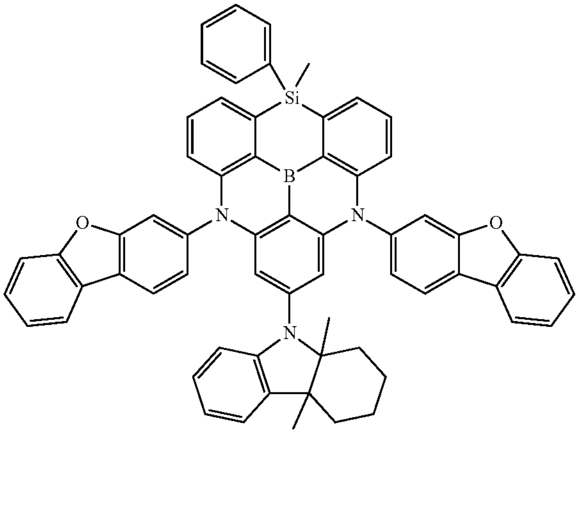

-continued
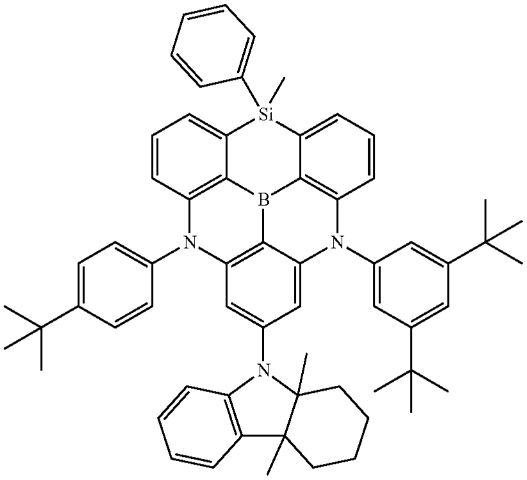
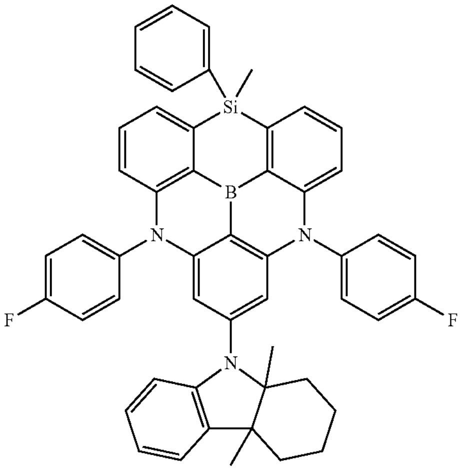
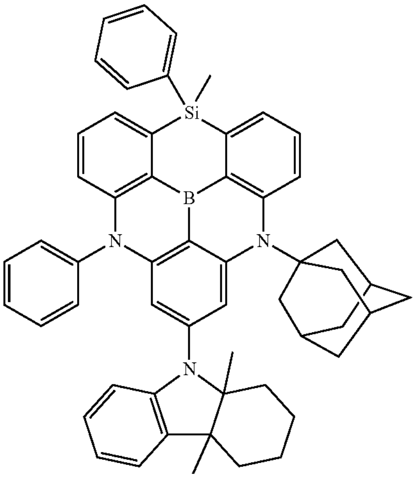
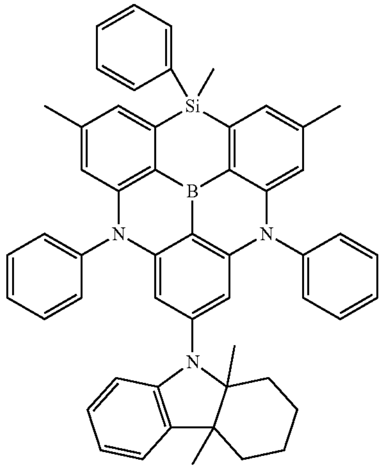
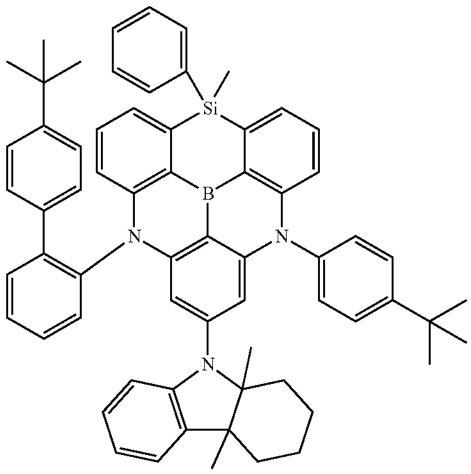
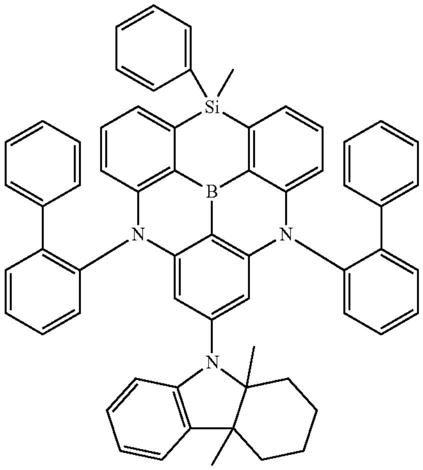

-continued
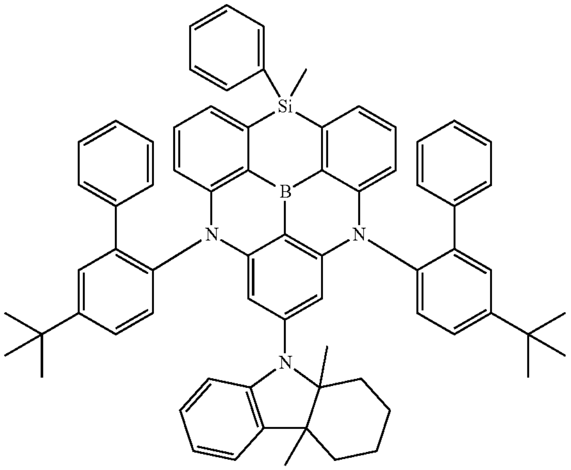
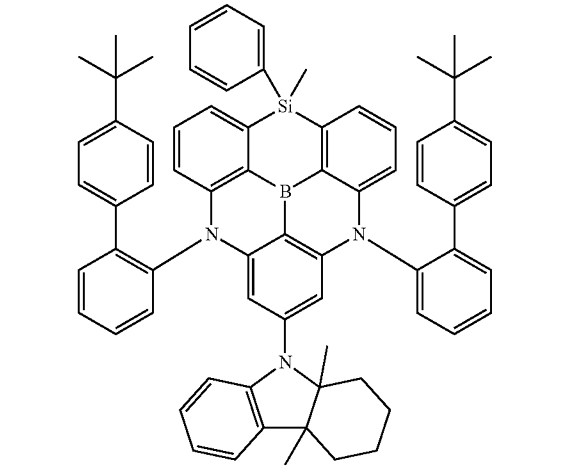
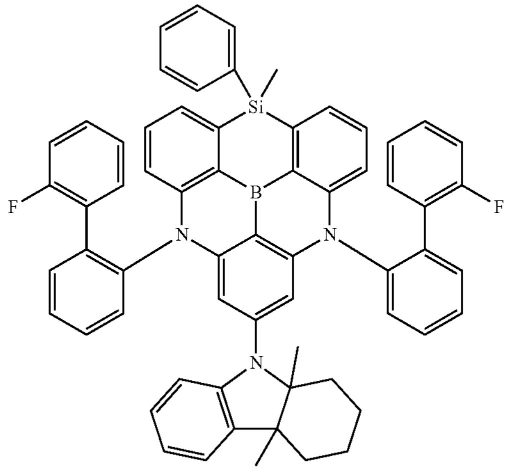
-continued
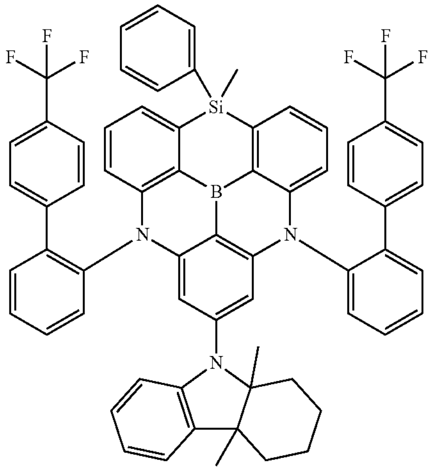
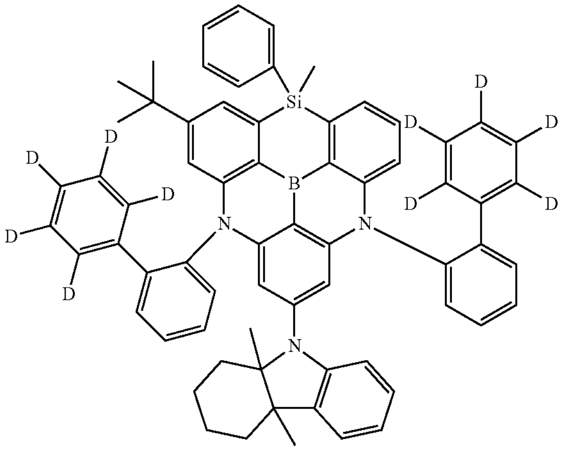
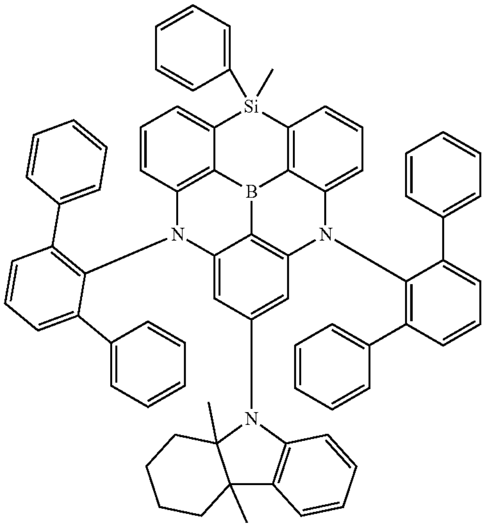

-continued
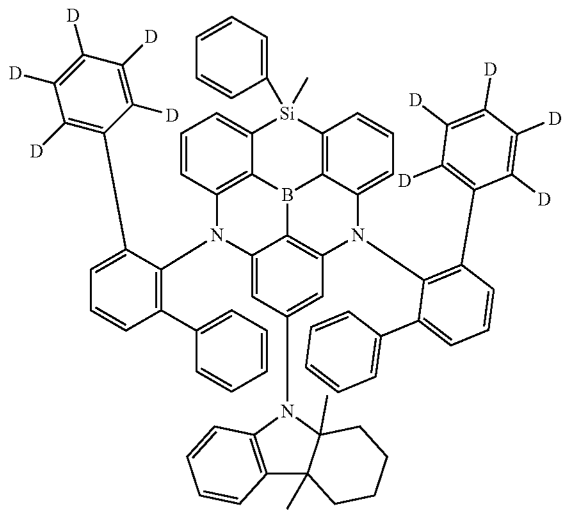
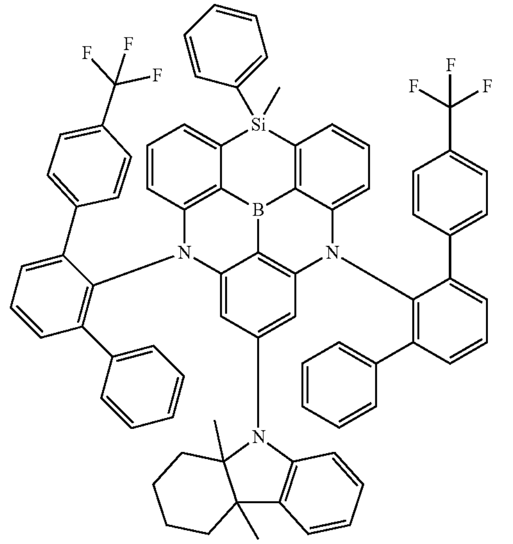
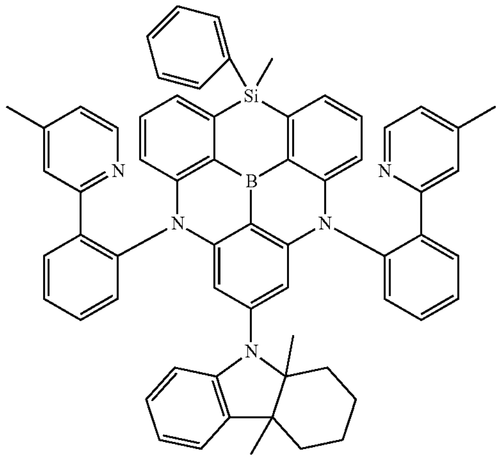
-continued
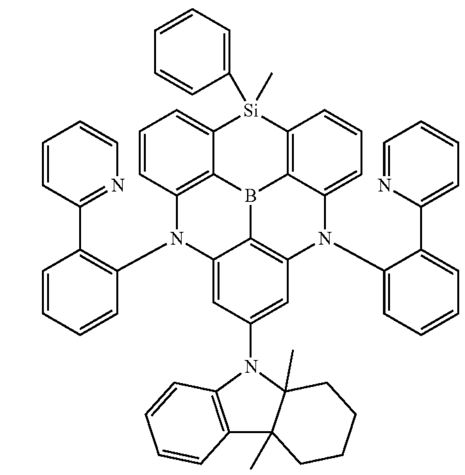
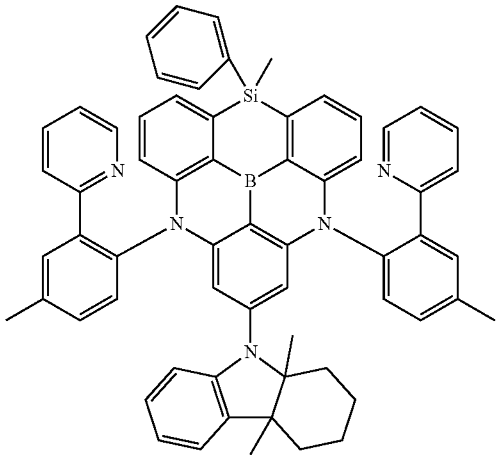
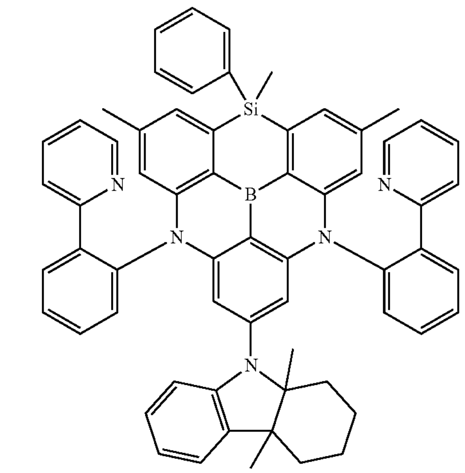

-continued
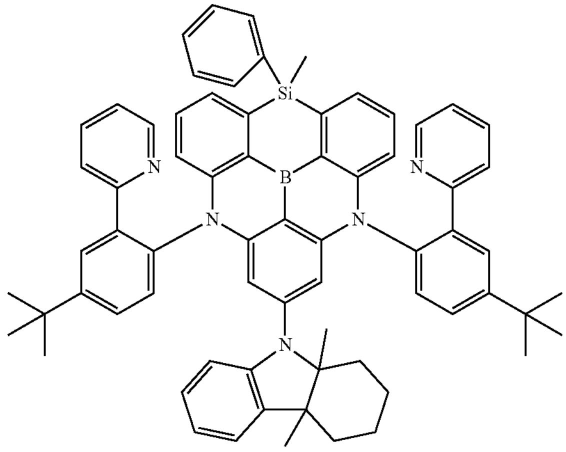
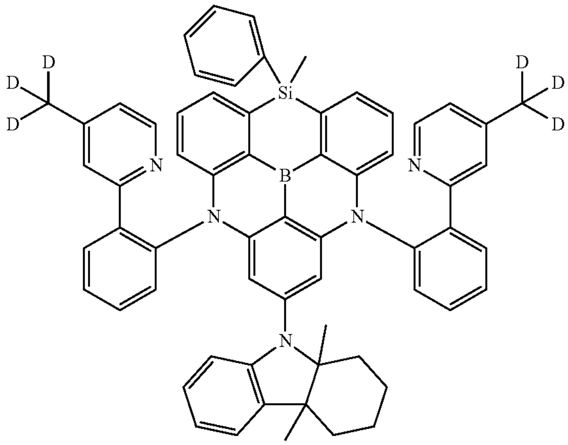
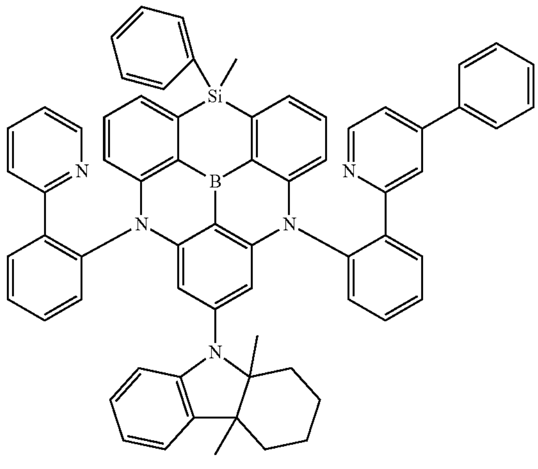
-continued
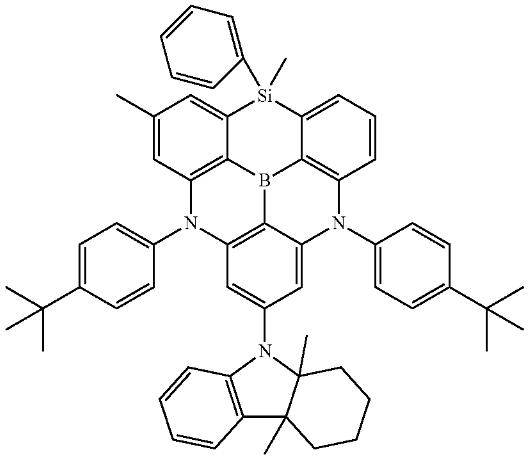
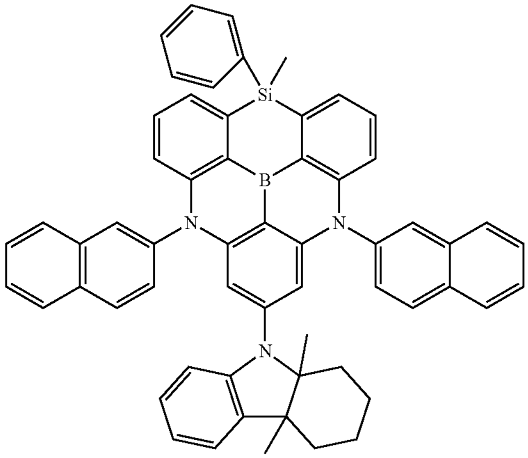
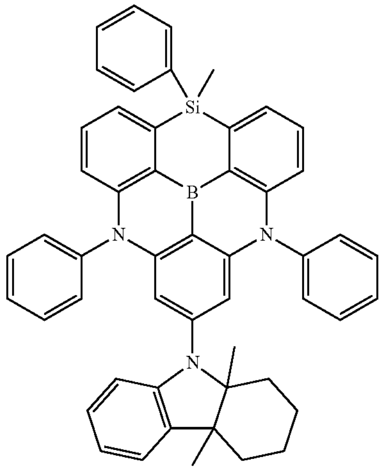

-continued
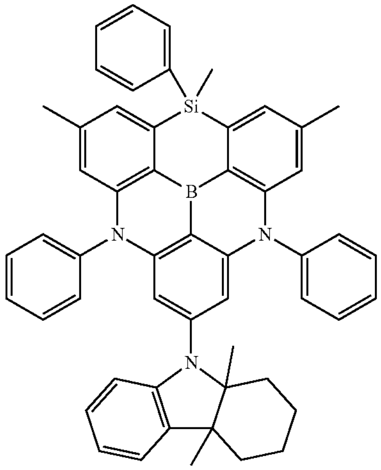
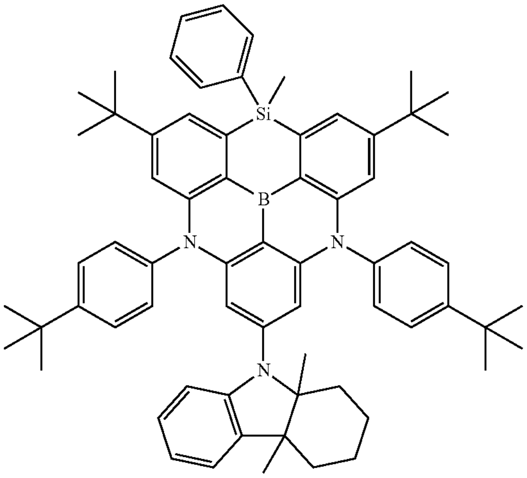
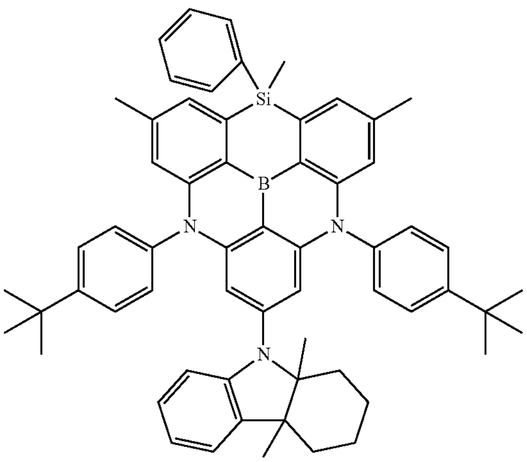
-continued
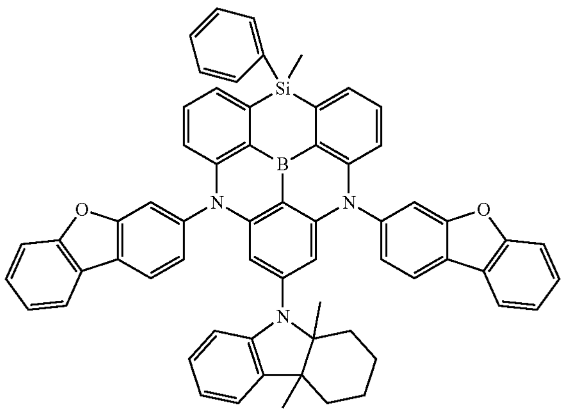
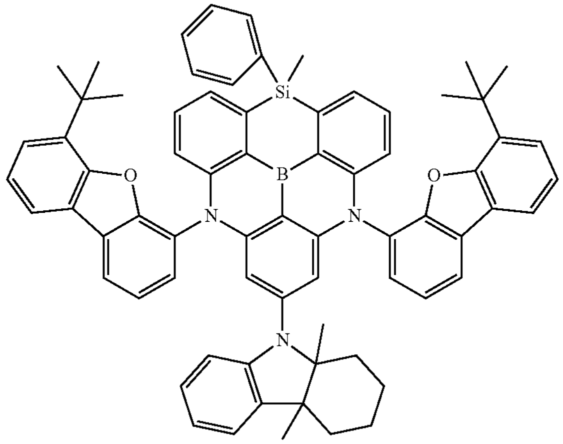
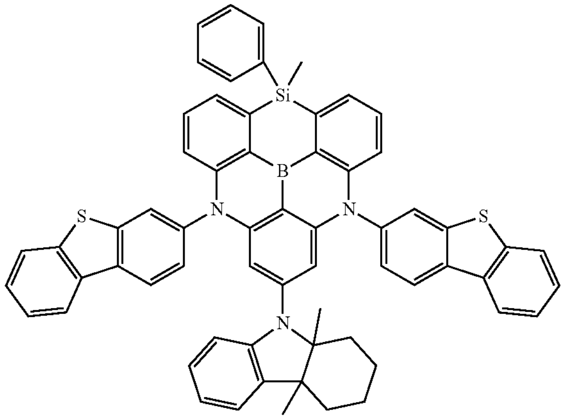
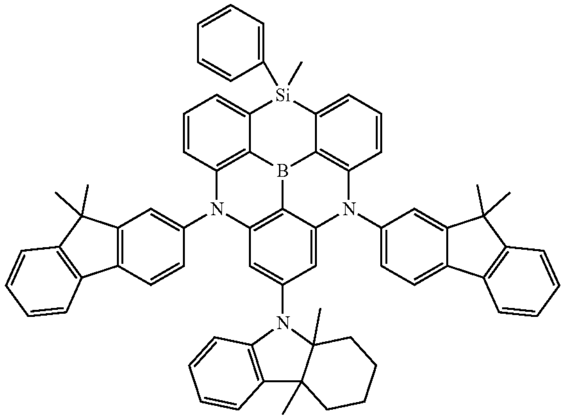

-continued
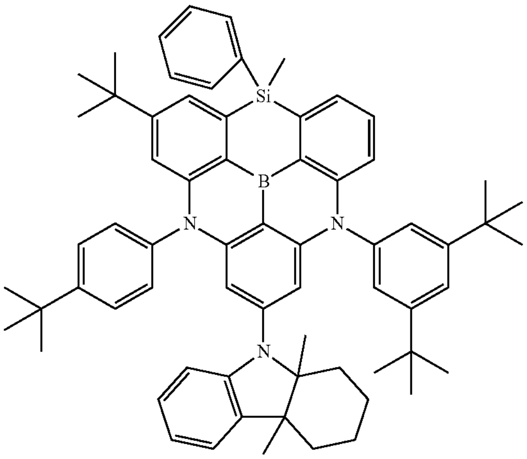
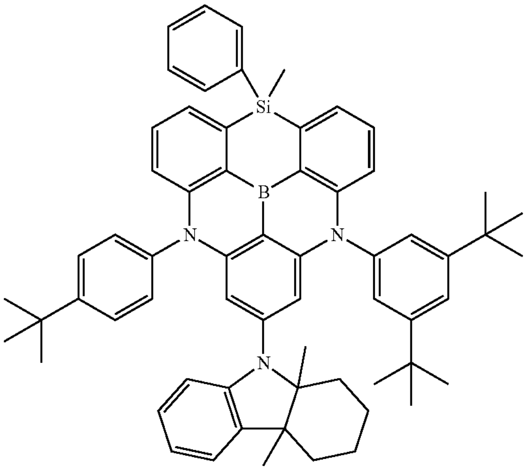
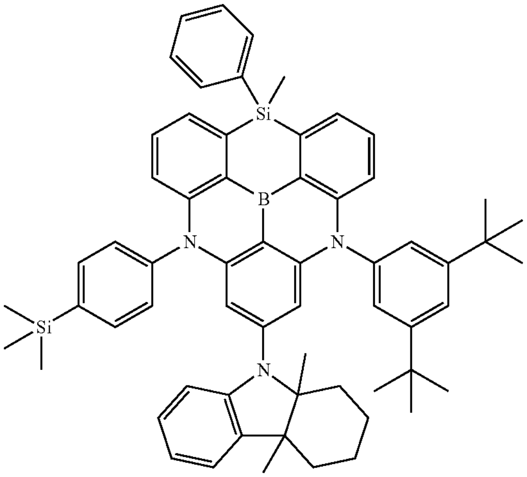
-continued
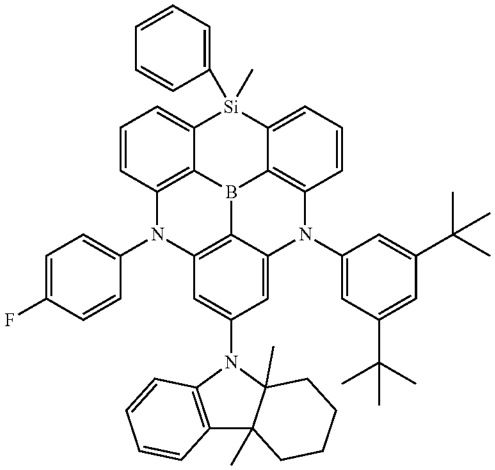
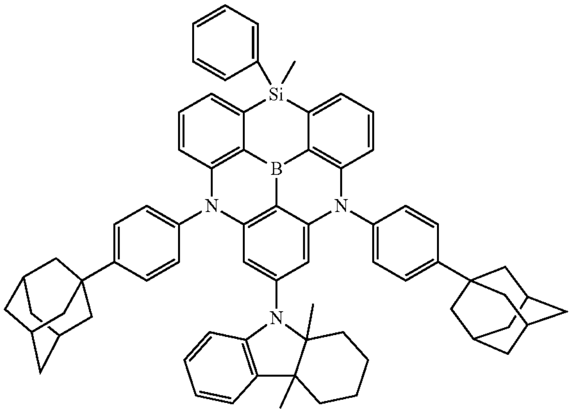
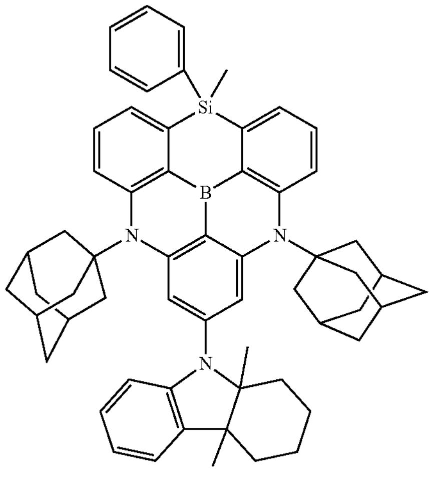

-continued
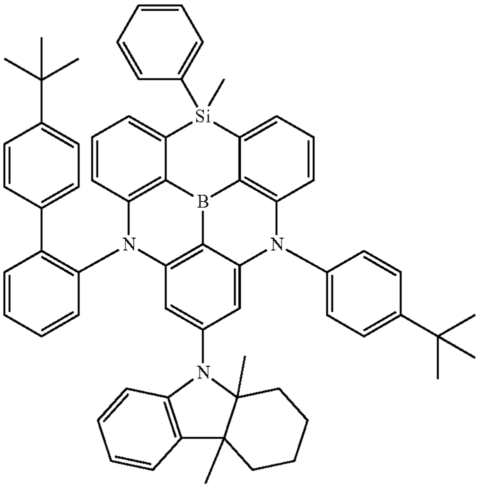
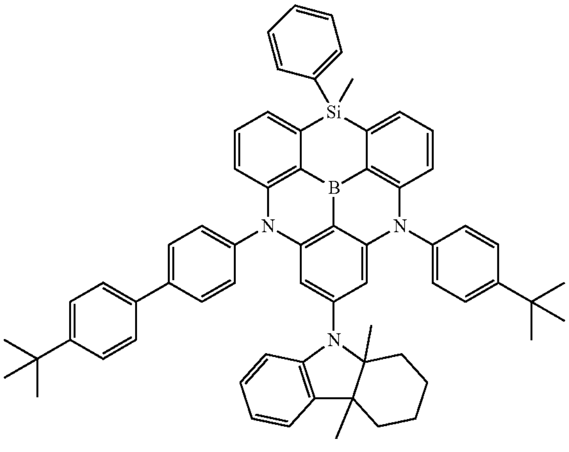
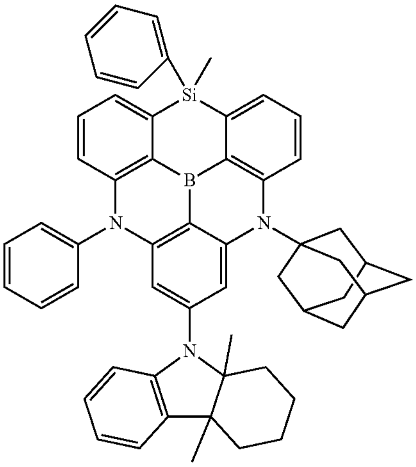
-continued
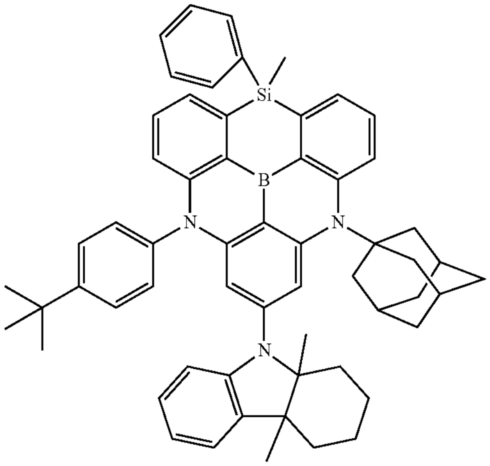
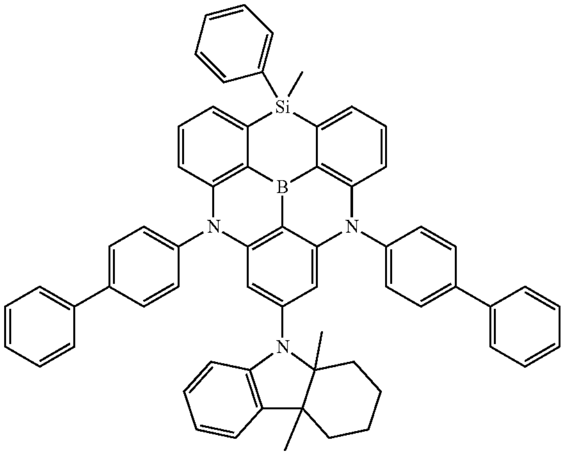
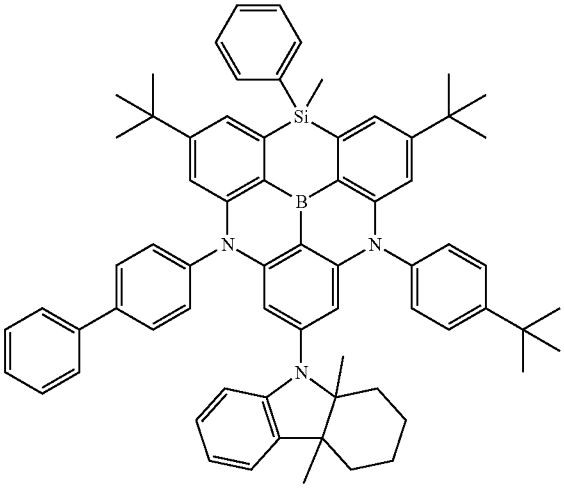

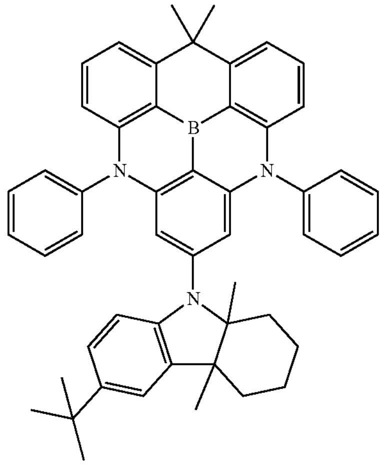
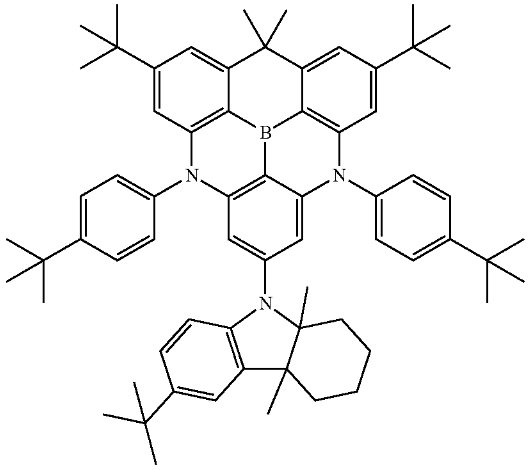
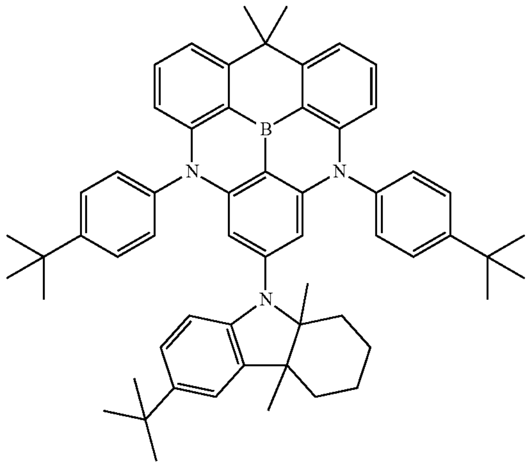
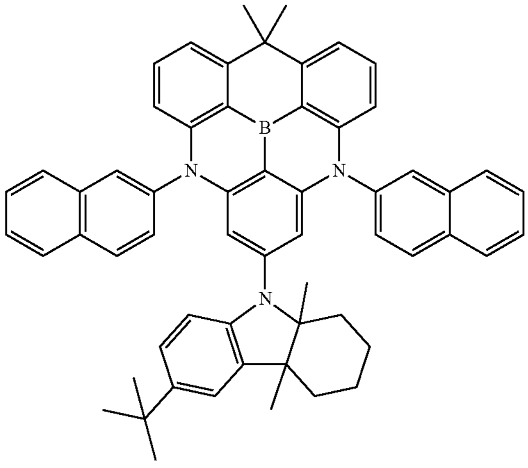
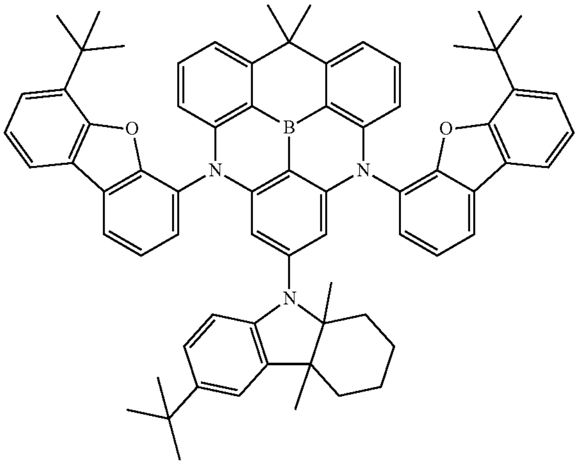
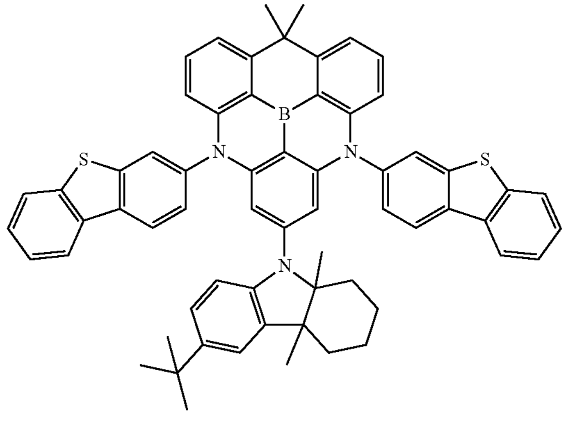

-continued
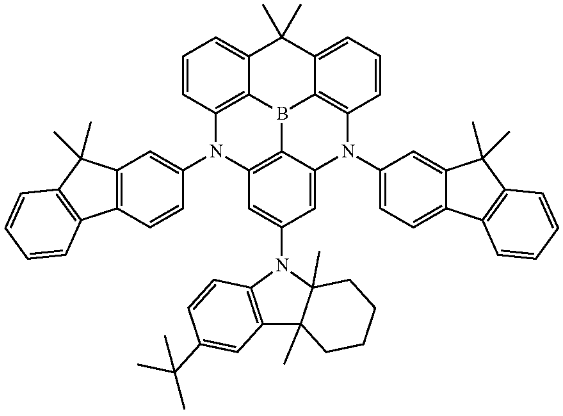
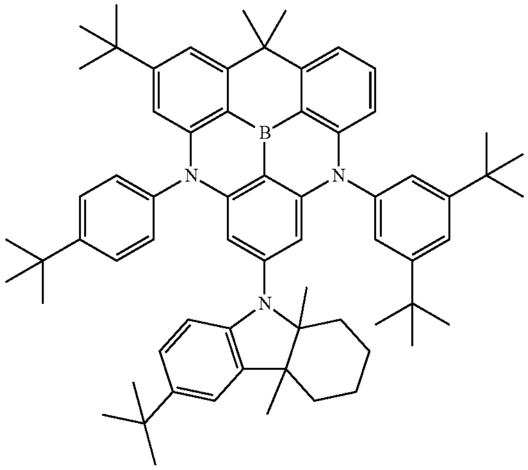
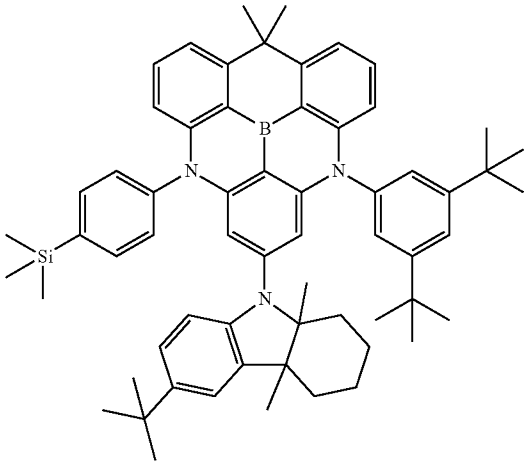
-continued
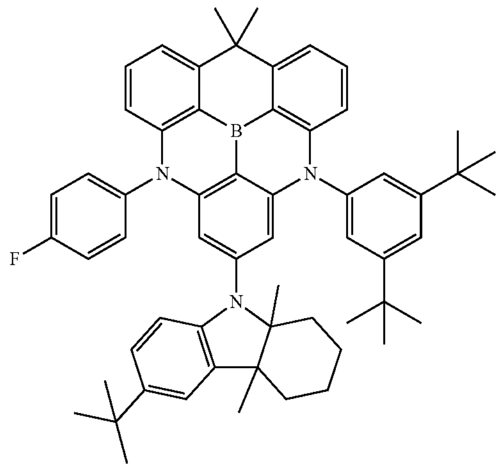
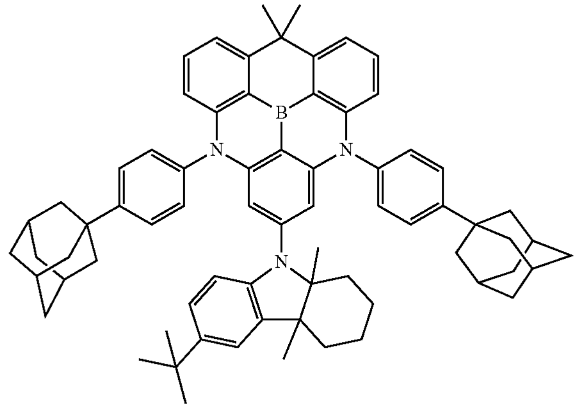
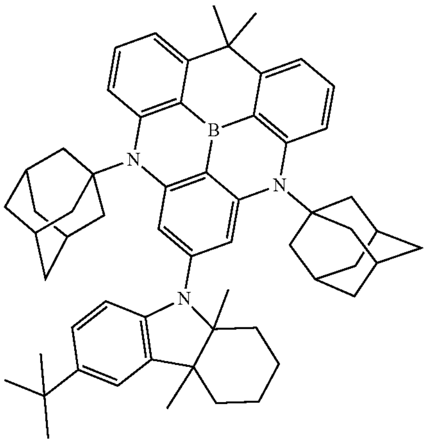

-continued
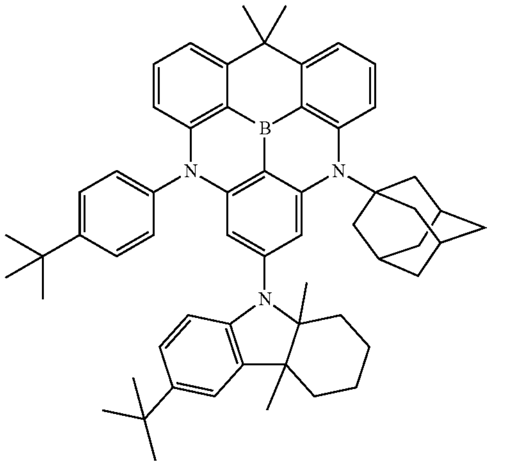
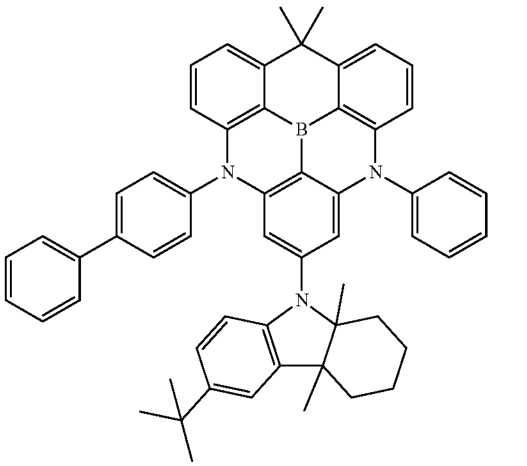
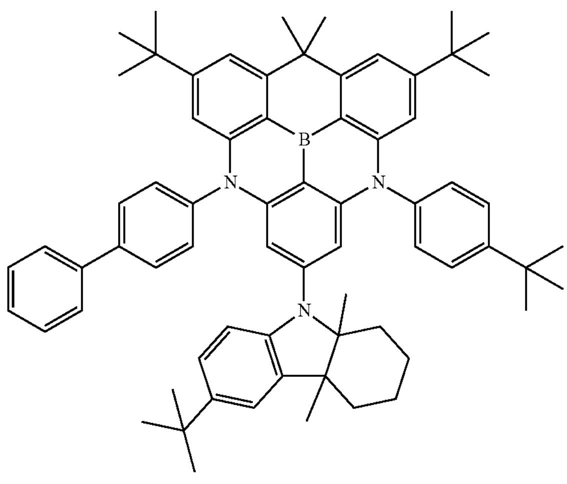
-continued
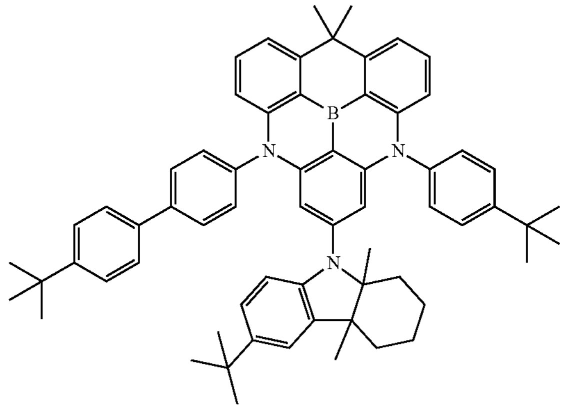
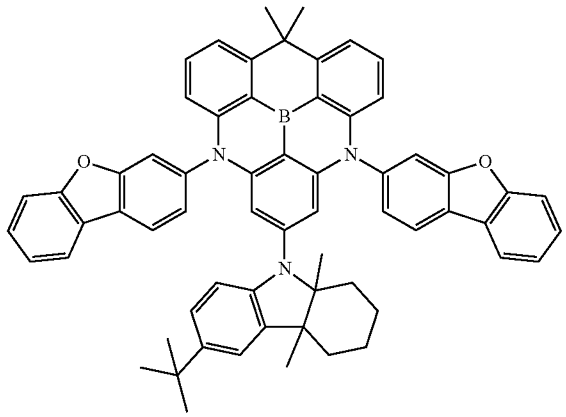
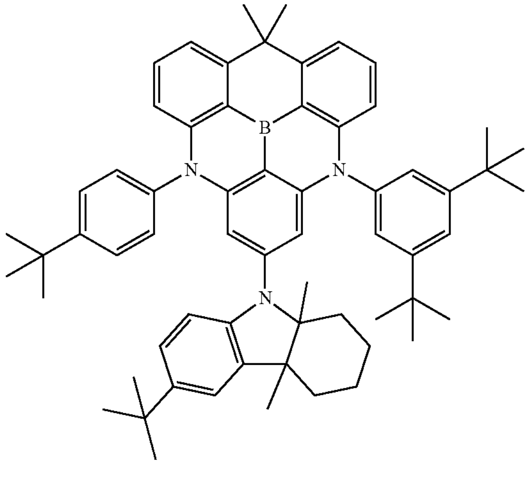

-continued
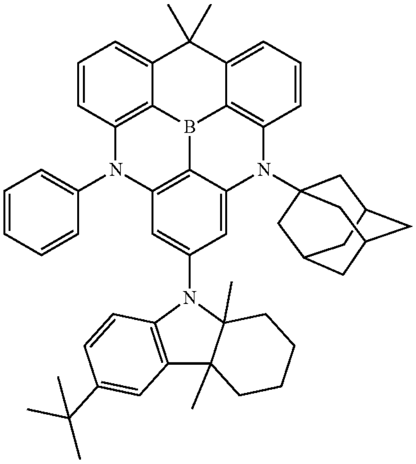
-continued
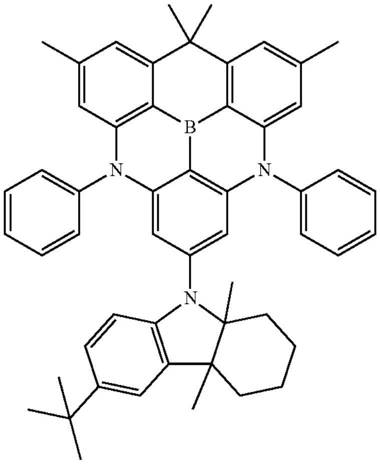
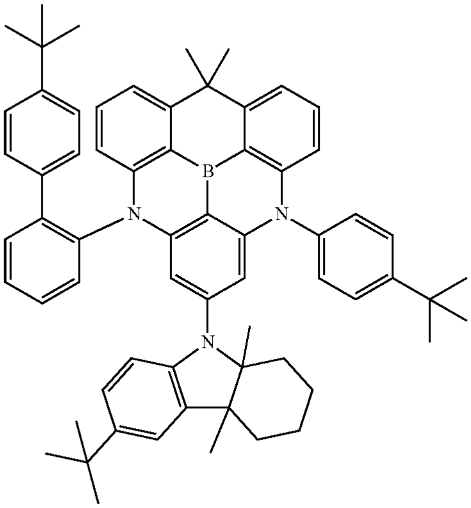
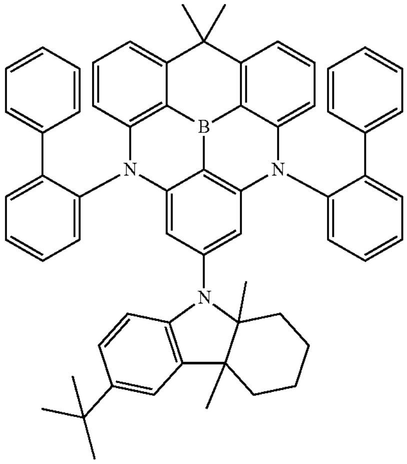
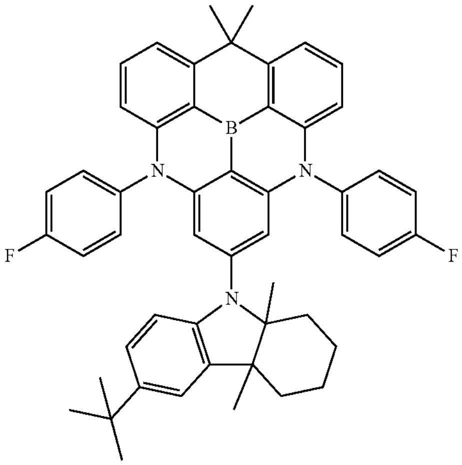
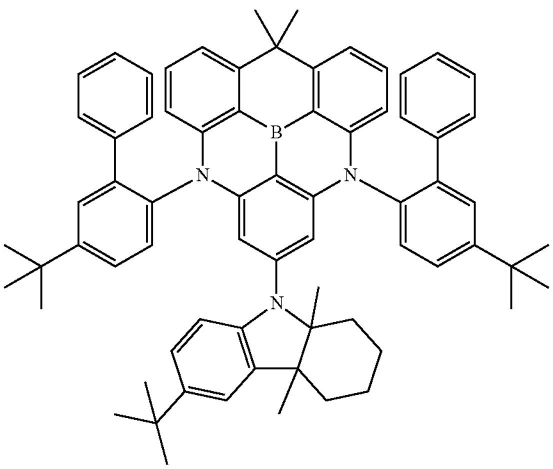

-continued
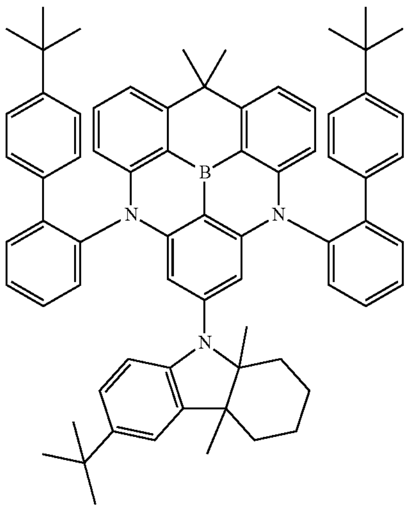
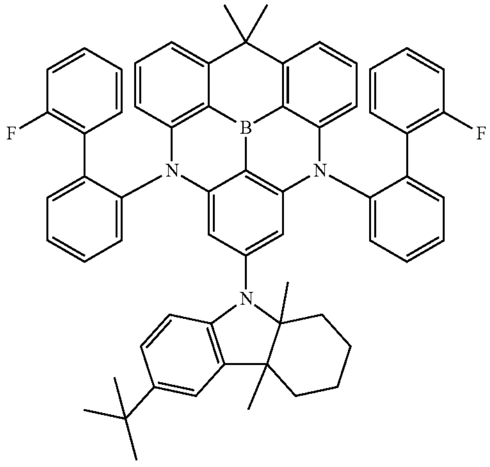
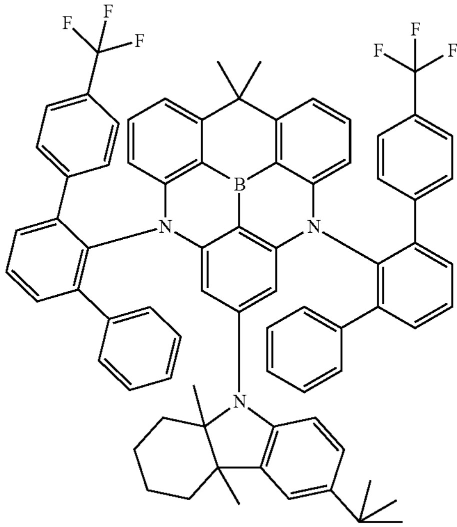
-continued
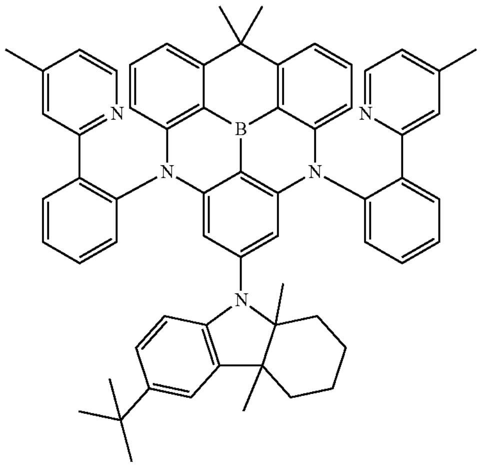
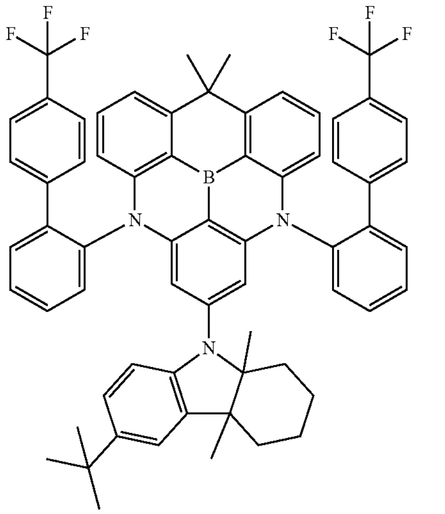
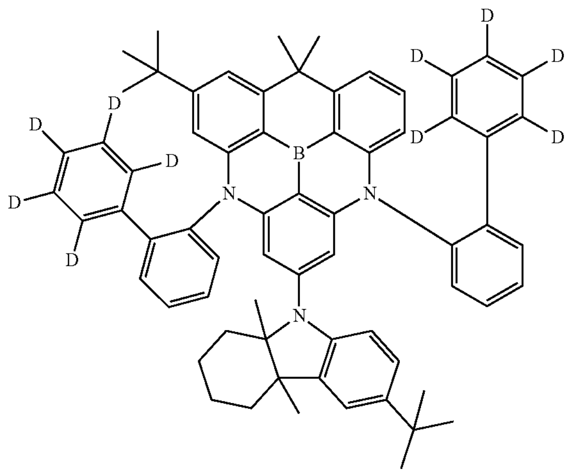

-continued
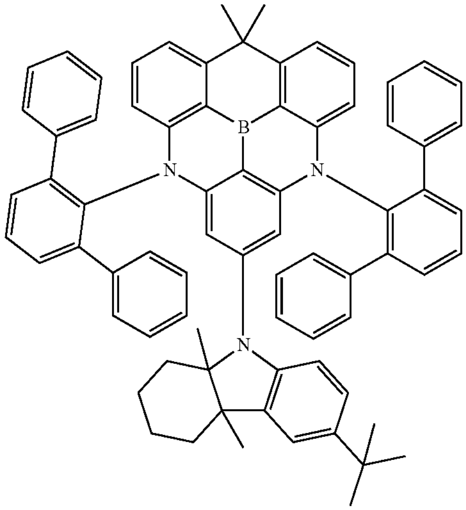
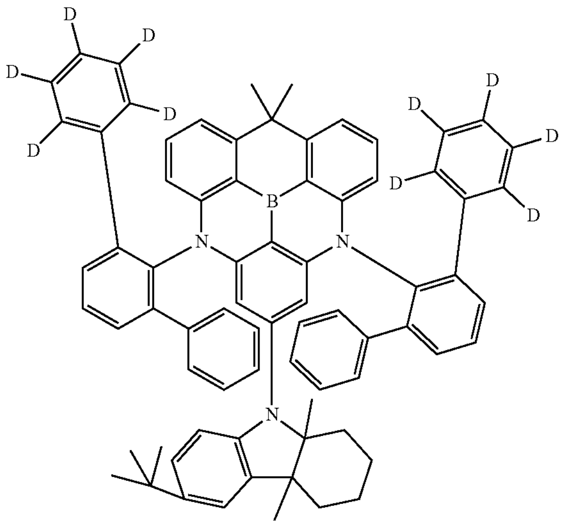
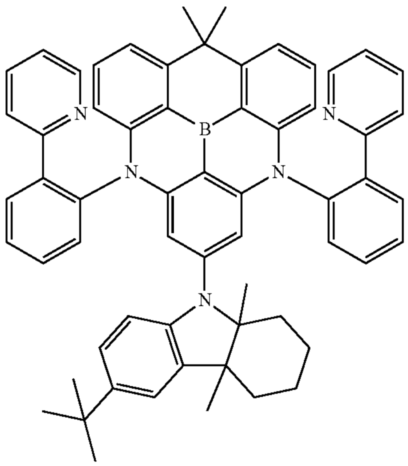
-continued
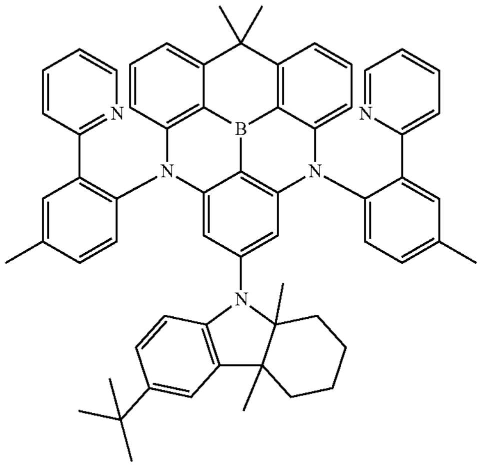
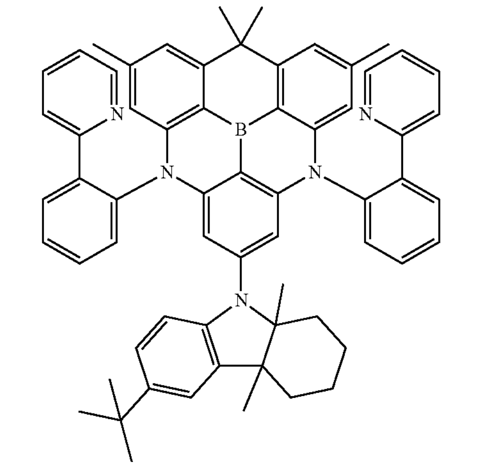
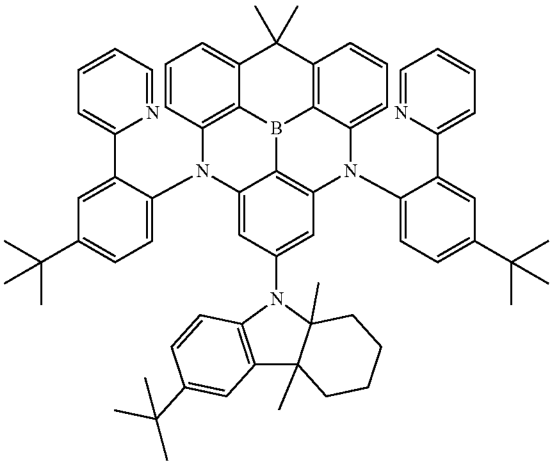

-continued
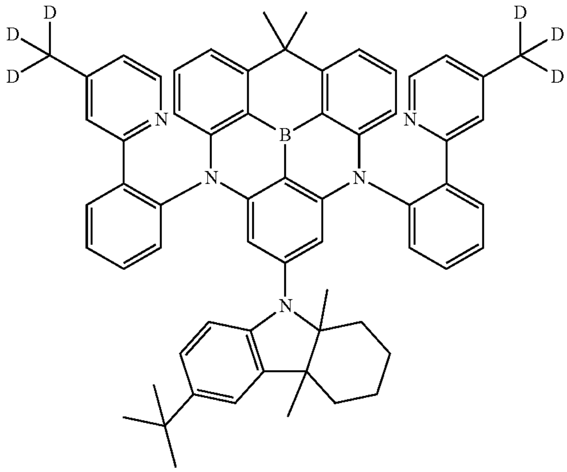
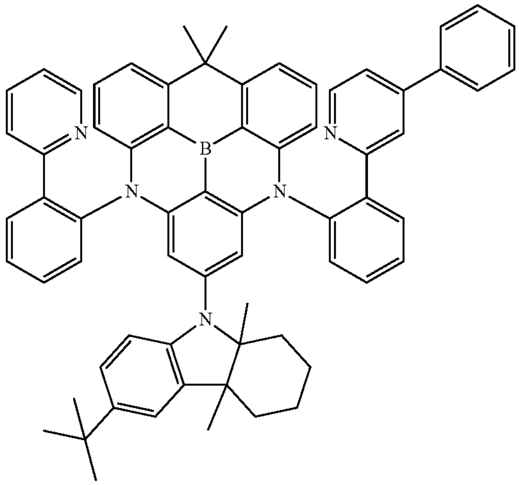
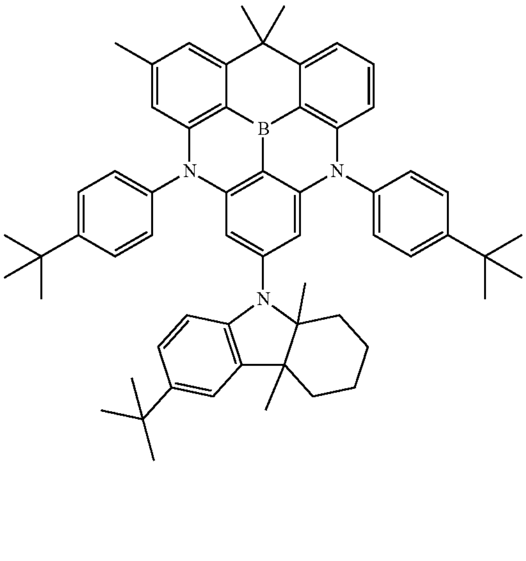
-continued
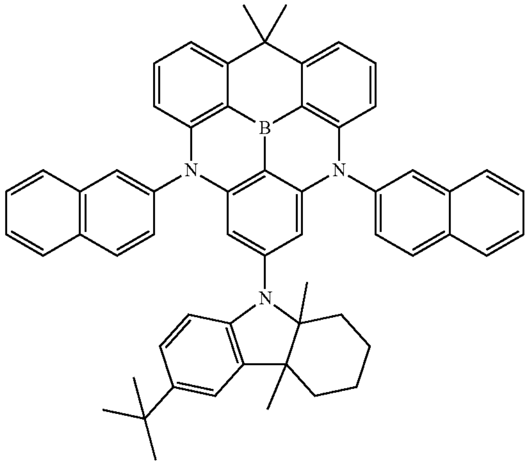
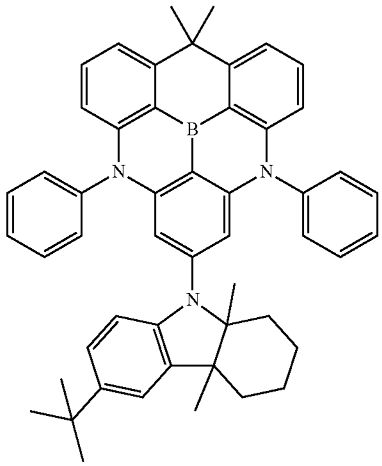
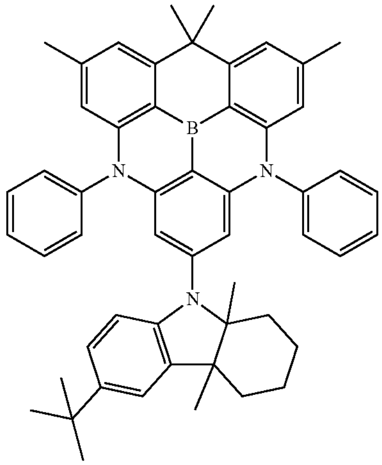

-continued
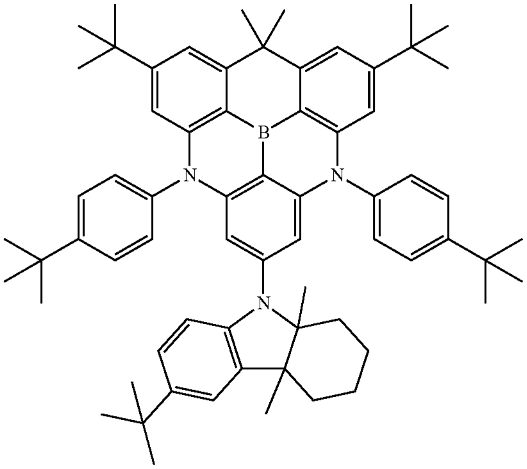
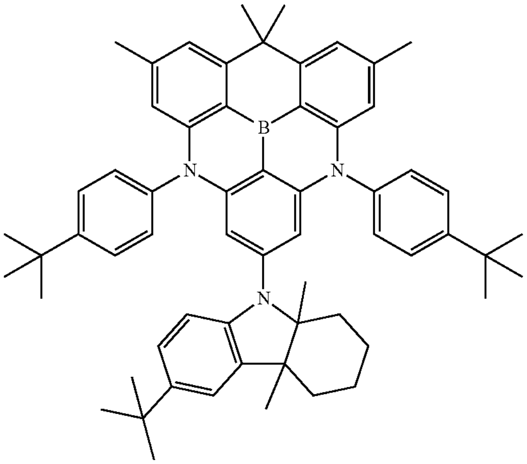
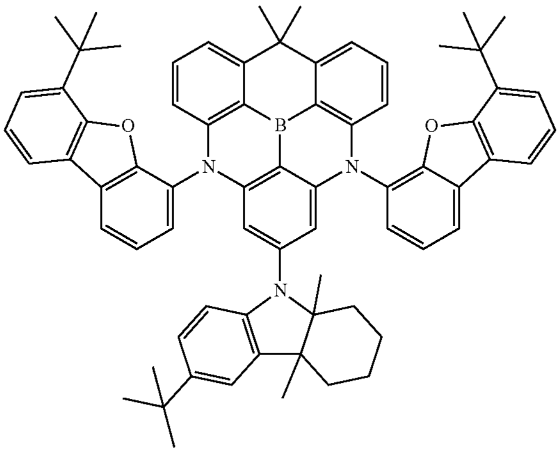
-continued
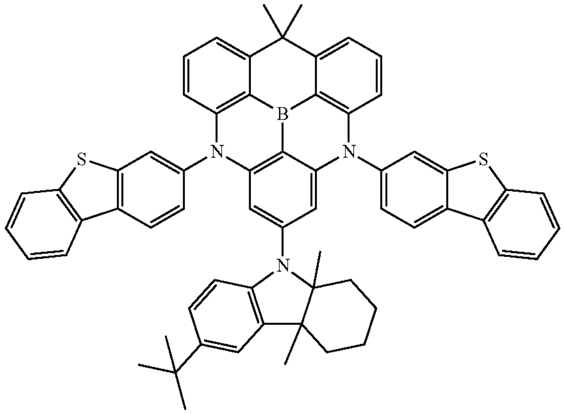
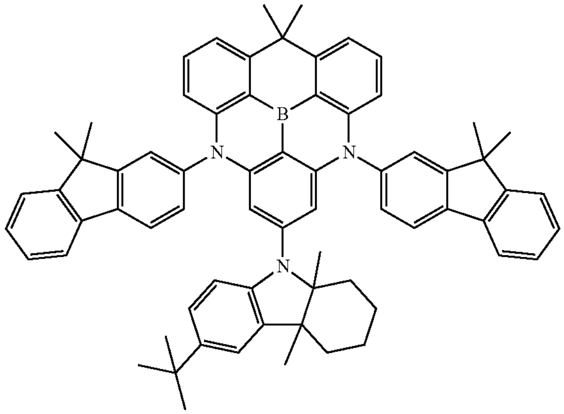
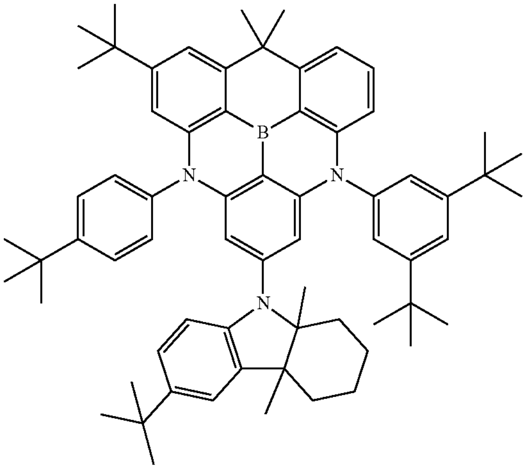

-continued
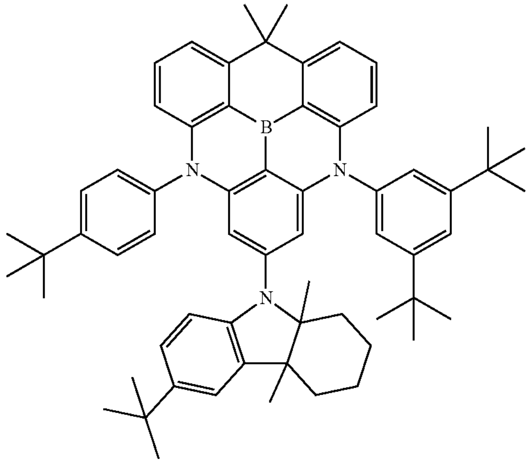
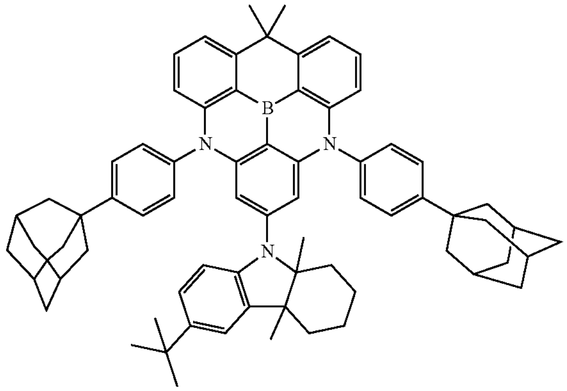
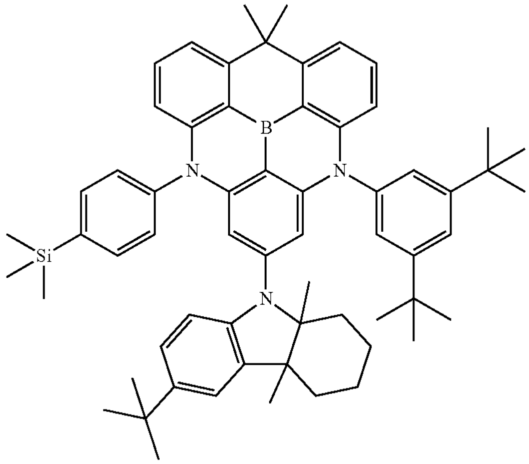
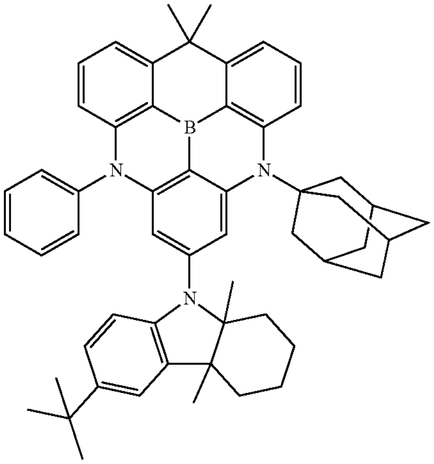
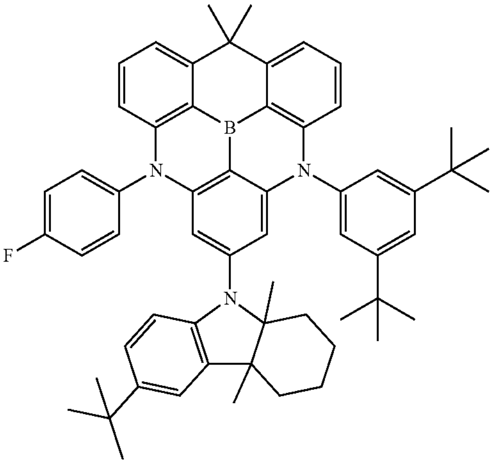
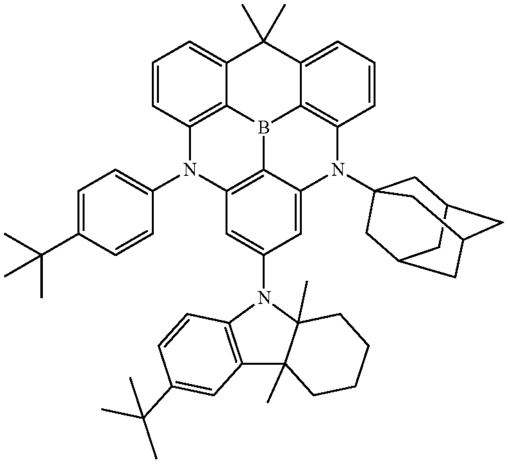

-continued
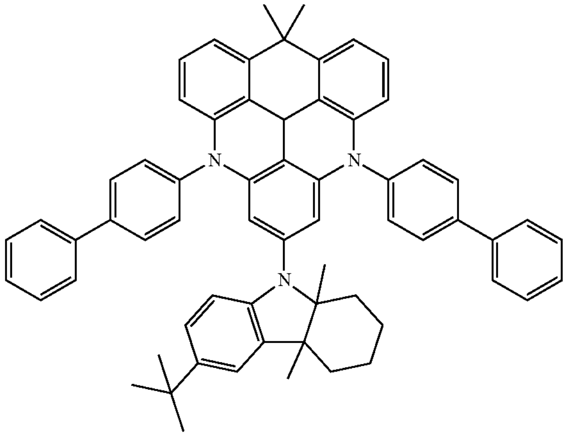
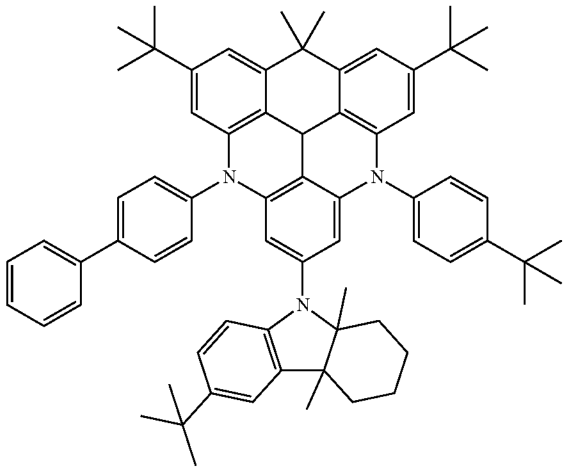
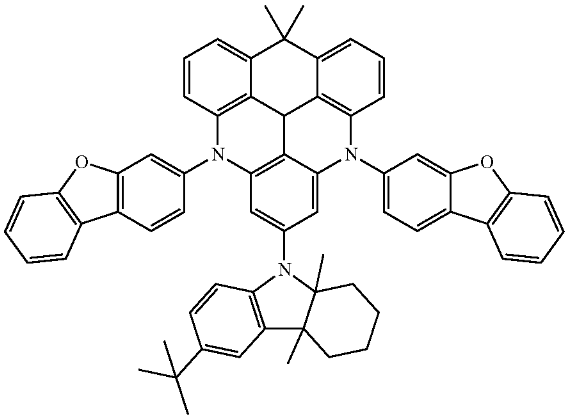
-continued
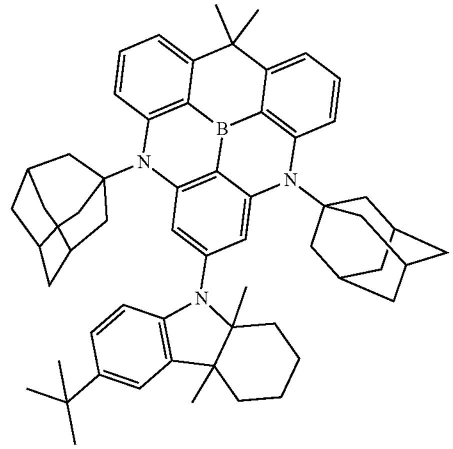
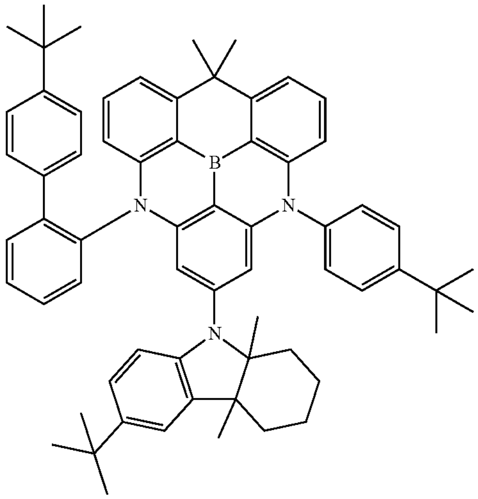
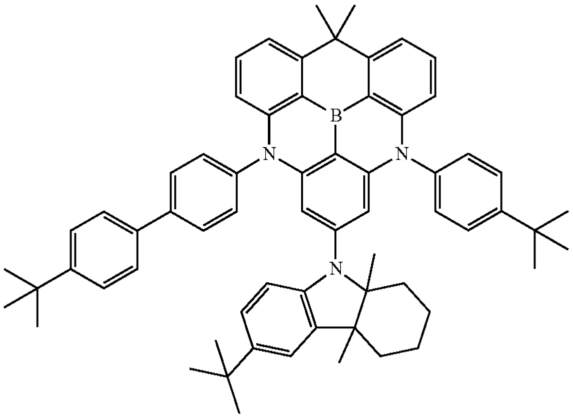

-continued
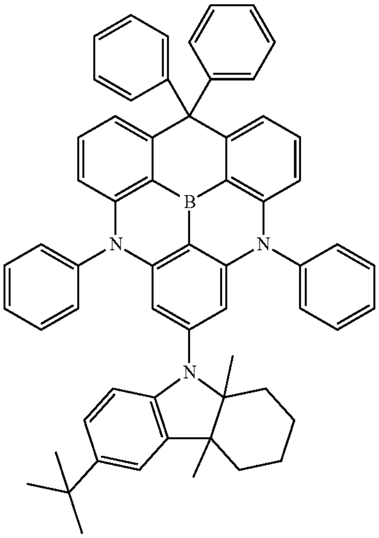
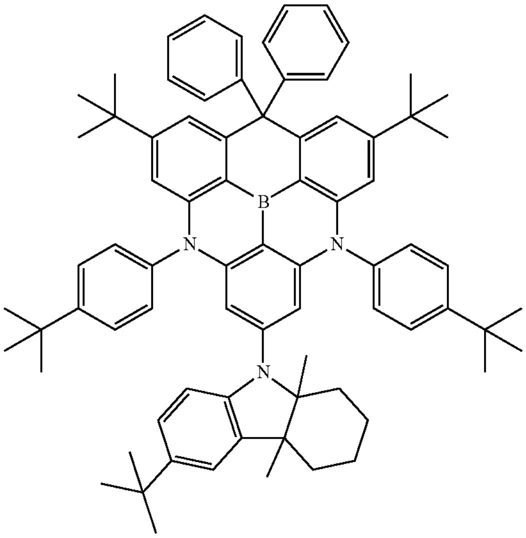
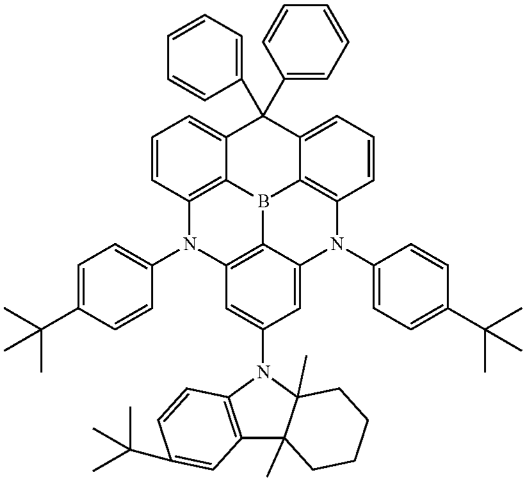
-continued
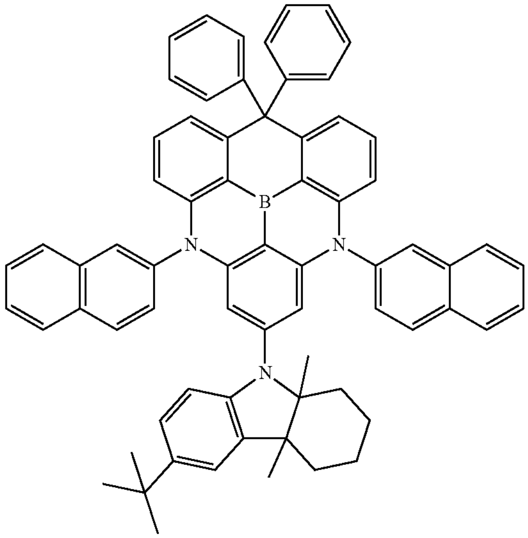
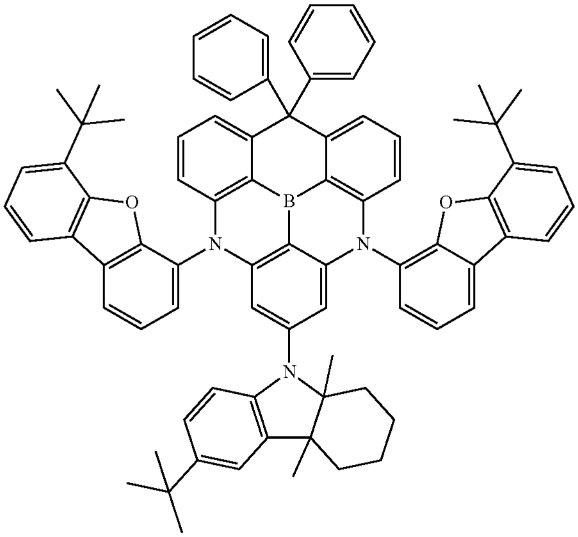
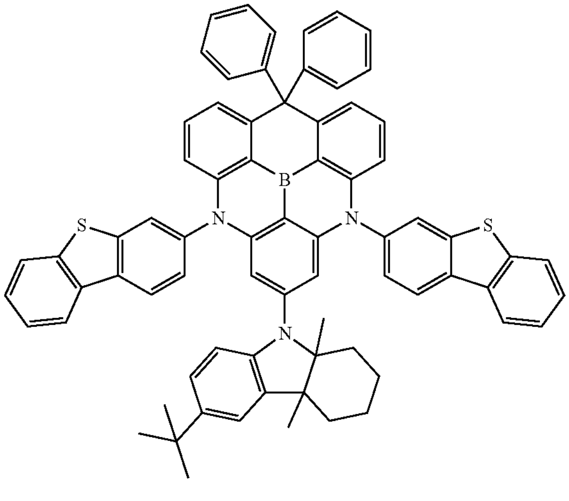

-continued
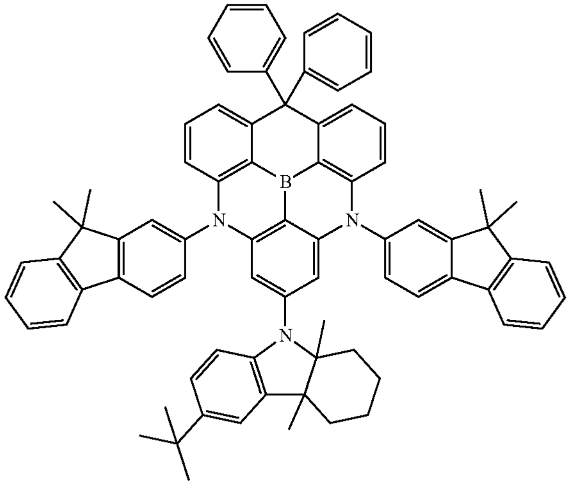
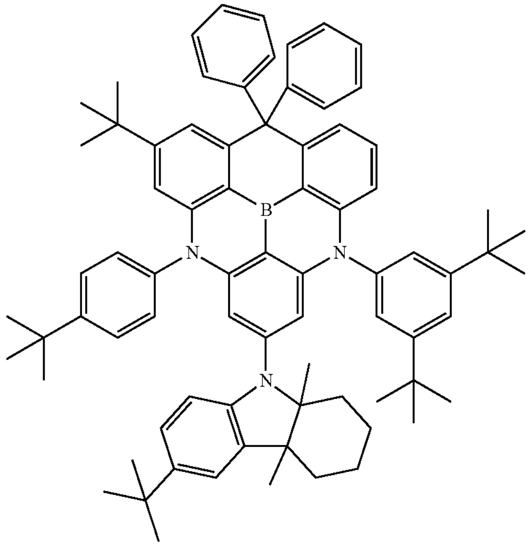
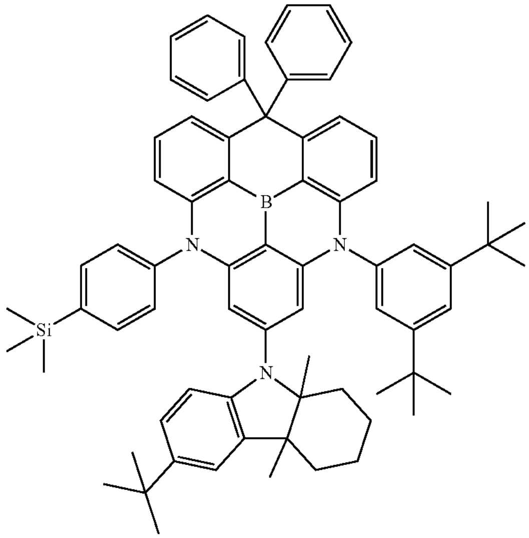
-continued
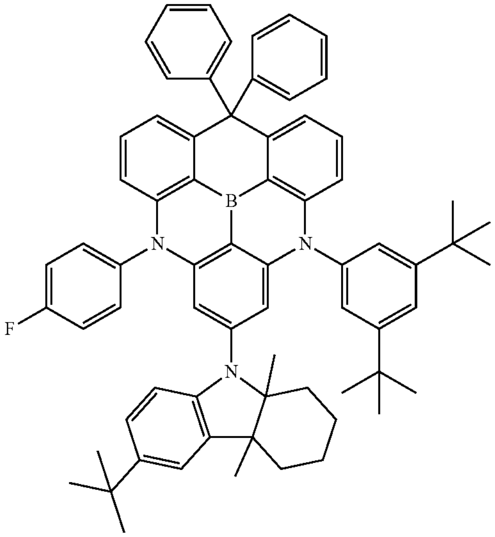
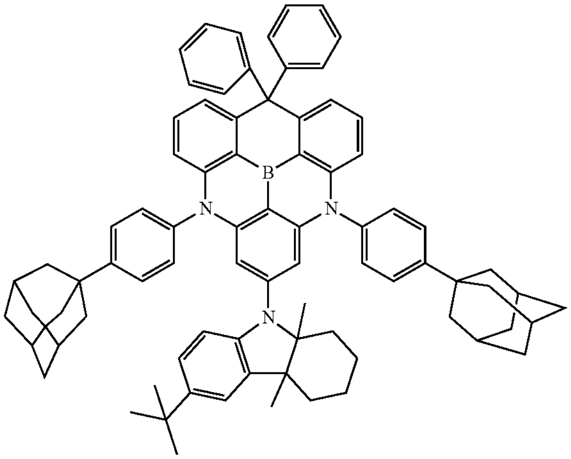
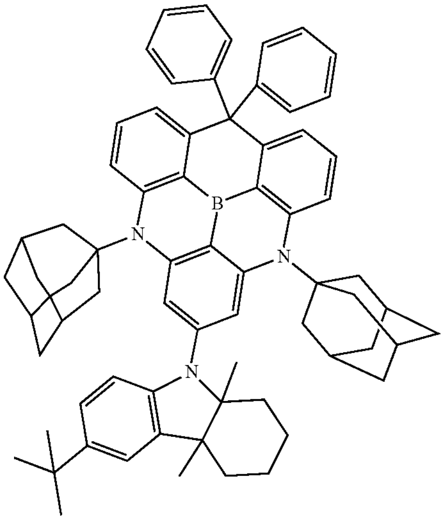

-continued
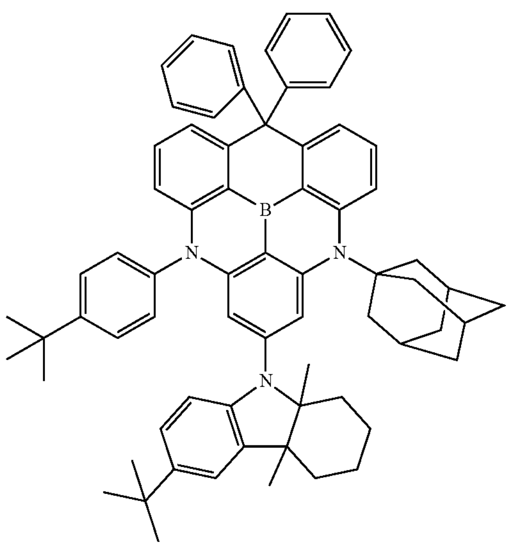
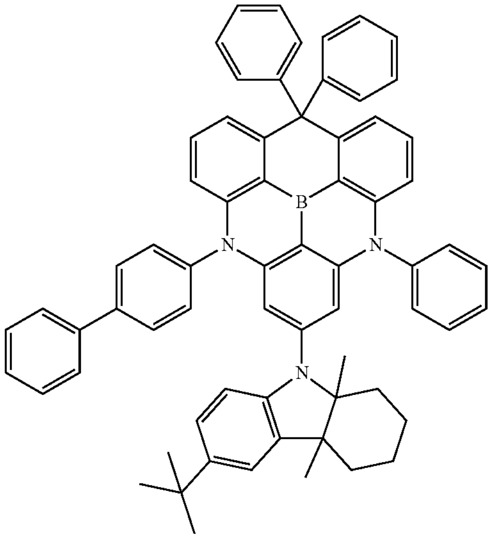
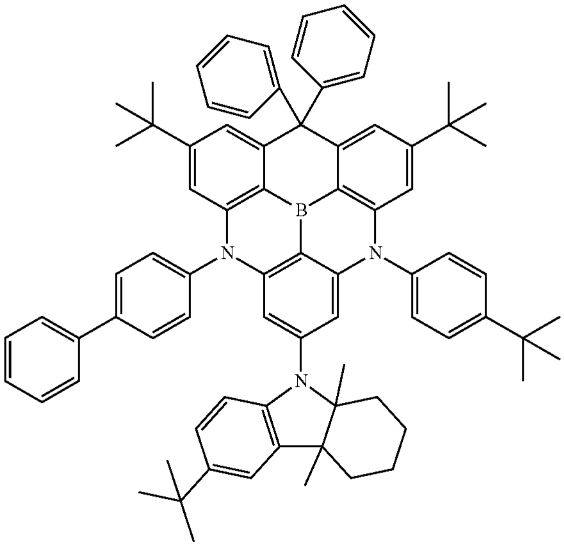
-continued
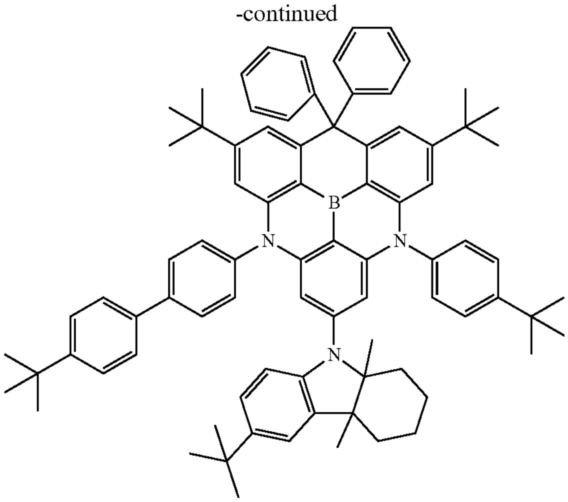
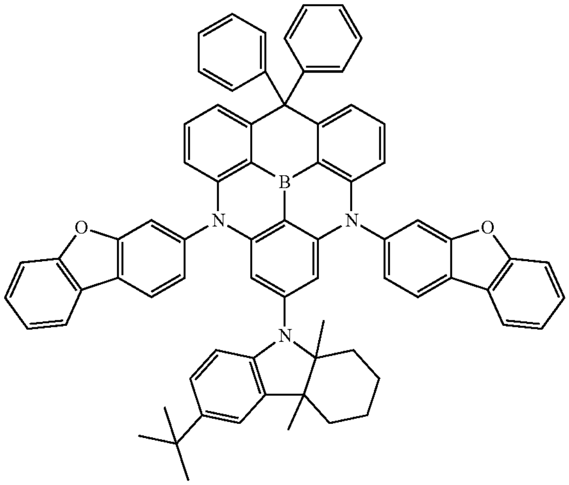
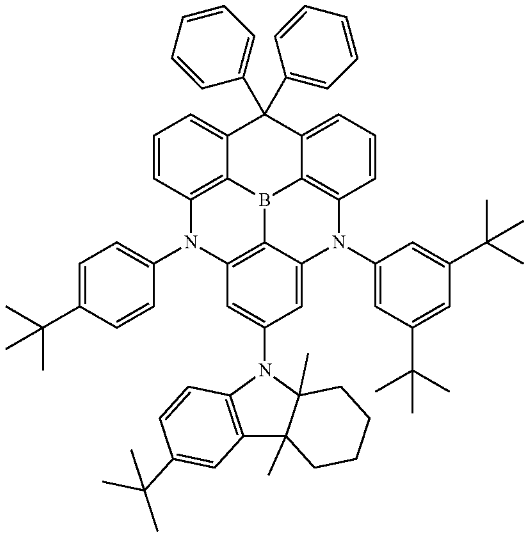

-continued
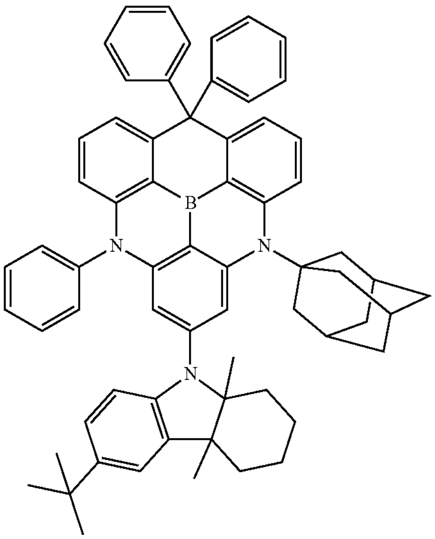
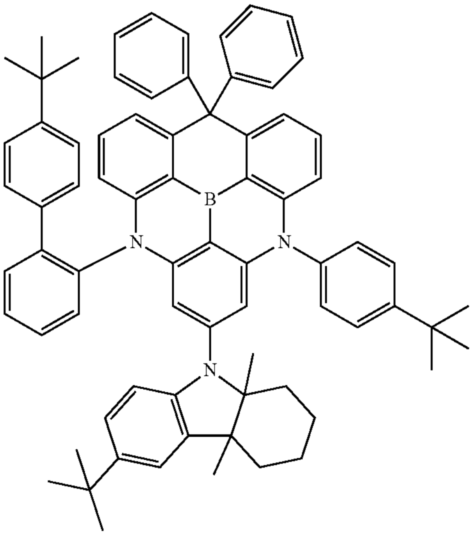
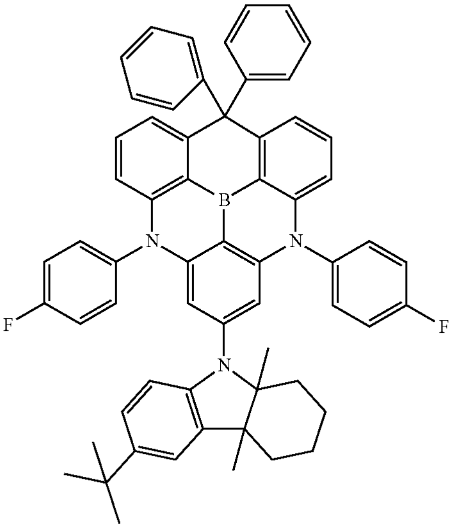
-continued
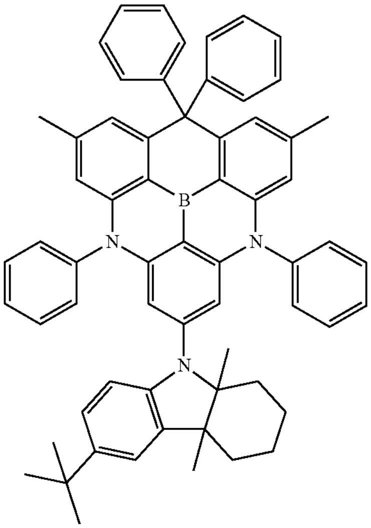
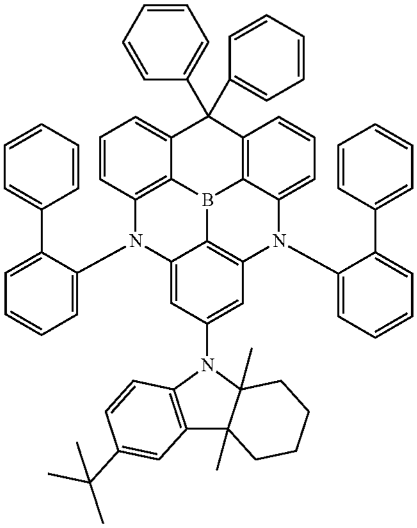
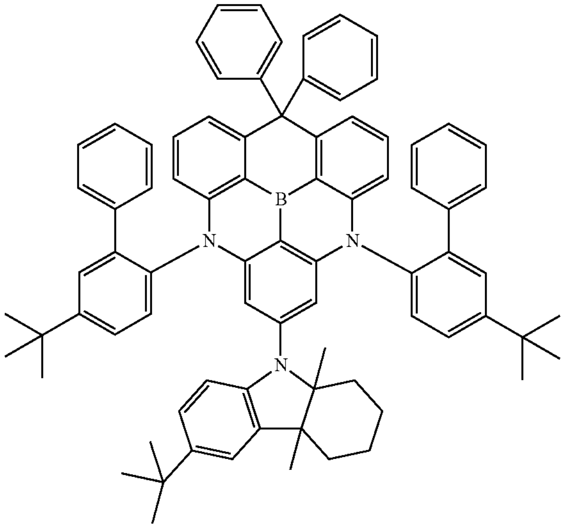

-continued
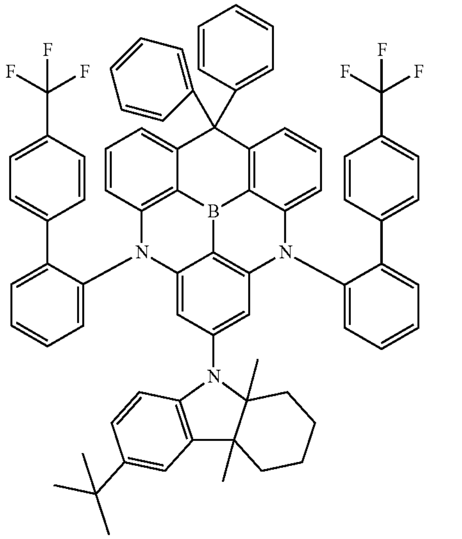
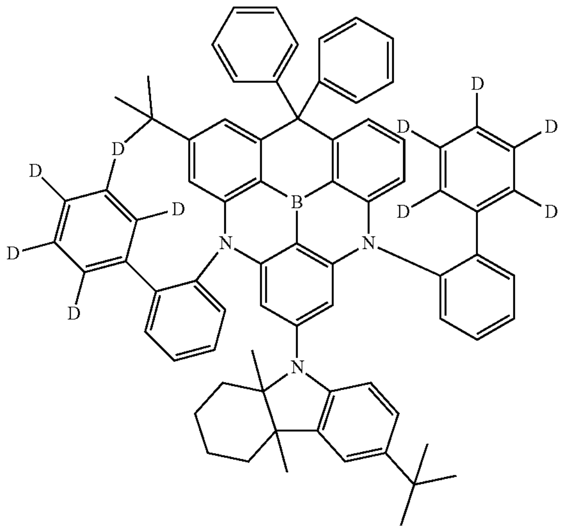
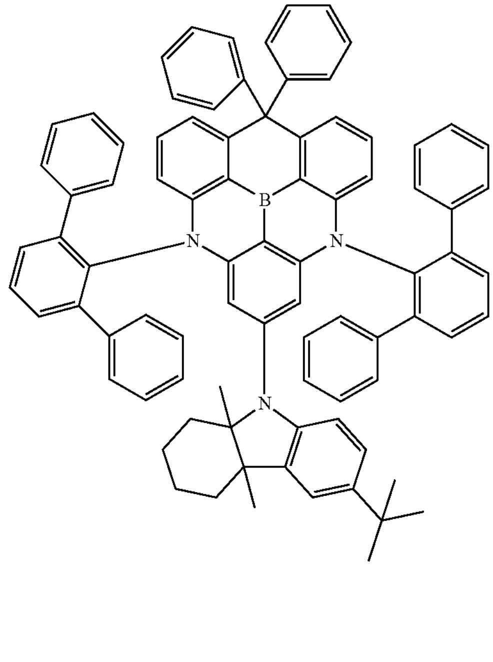
-continued
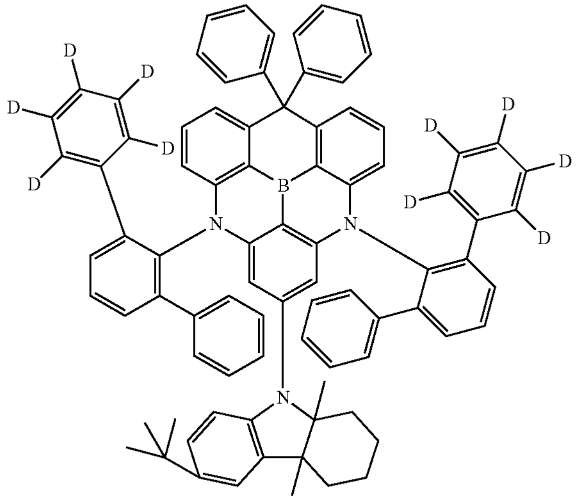
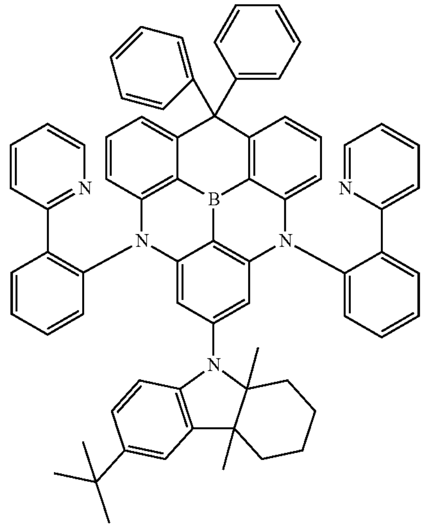
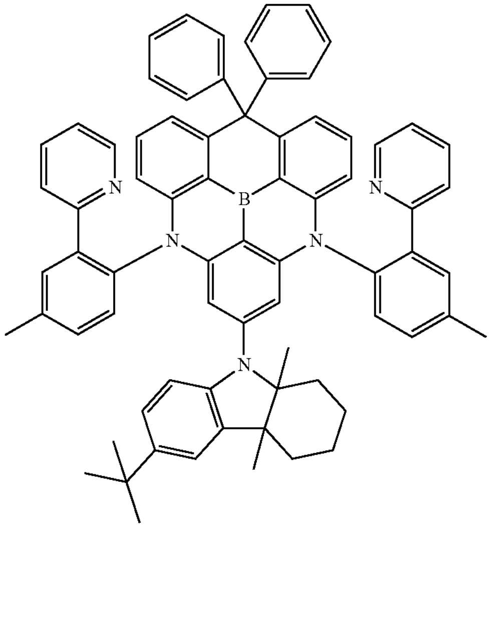

-continued
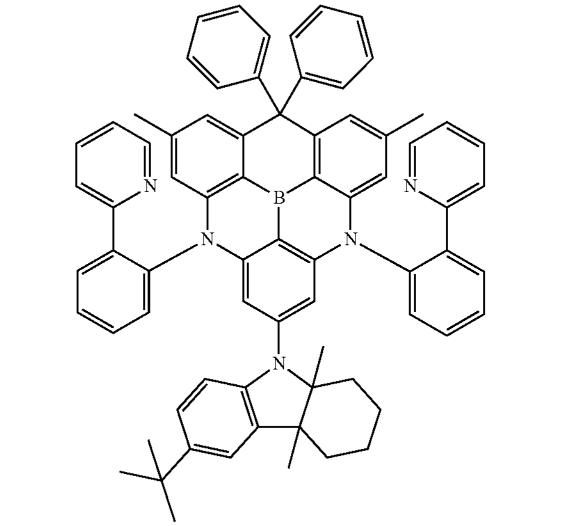
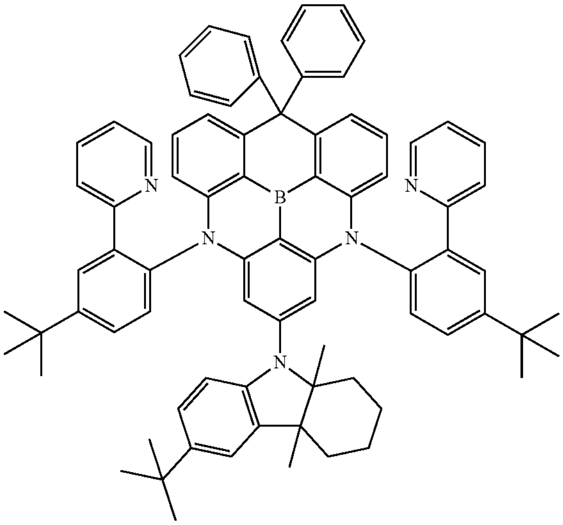
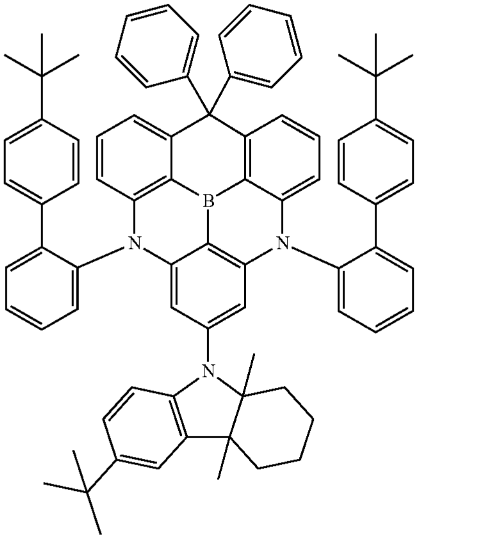
-continued
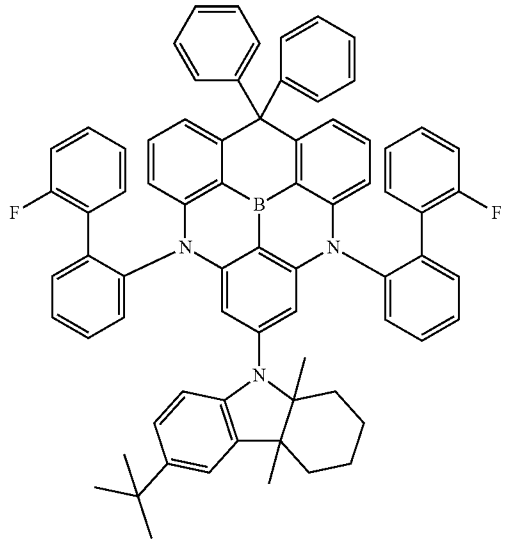
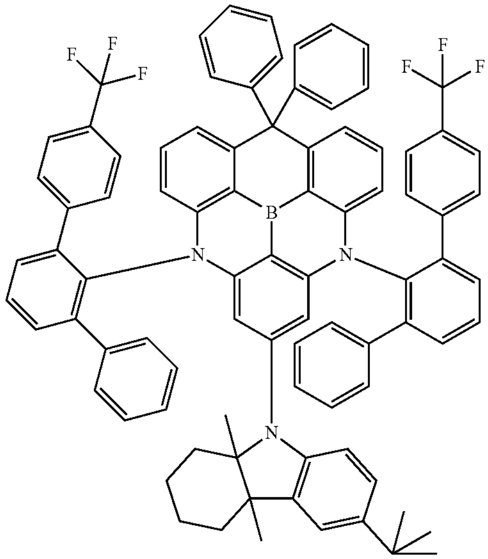
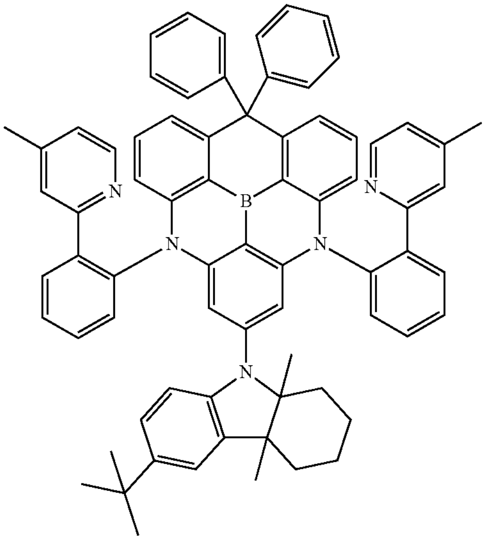

-continued
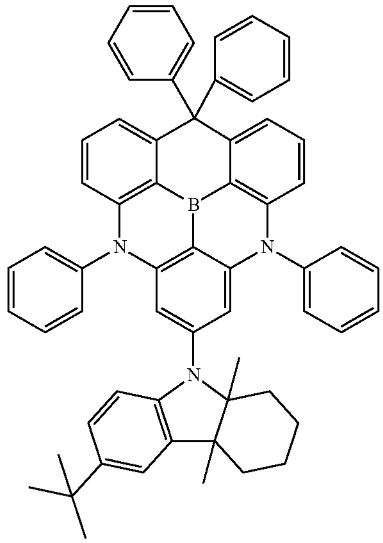
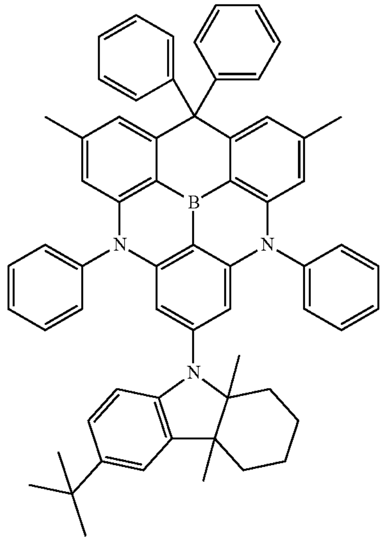
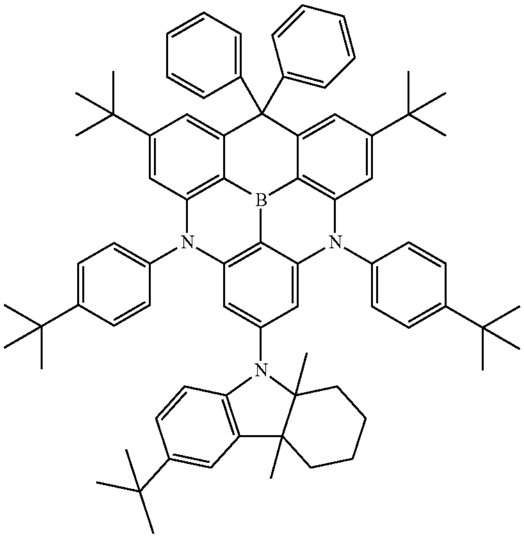
-continued
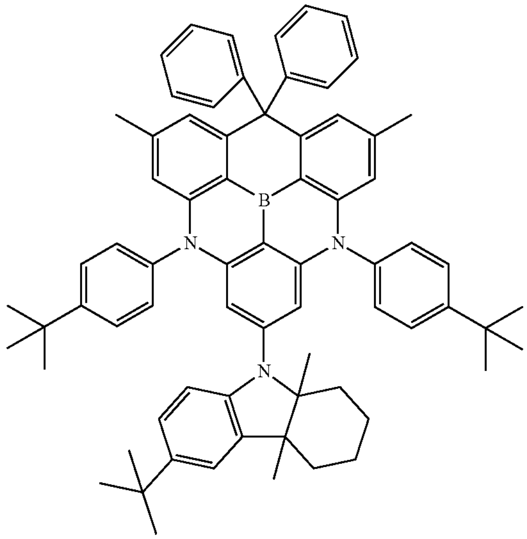
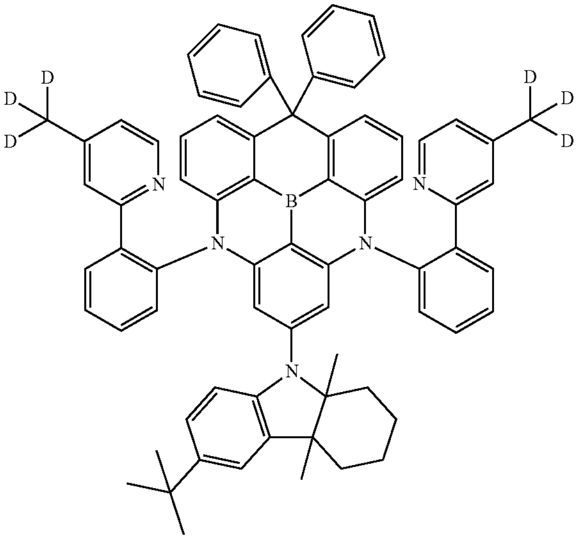
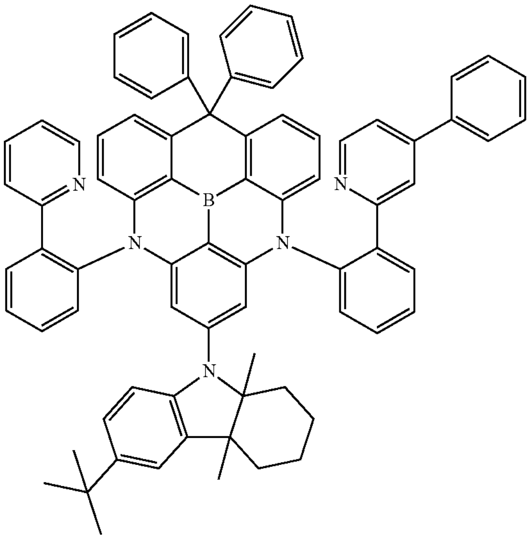

-continued
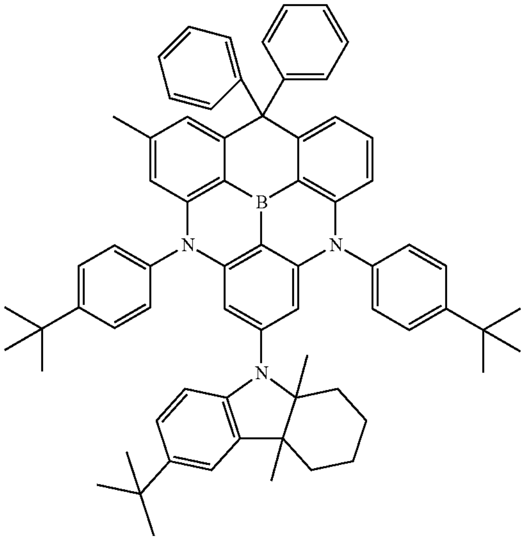
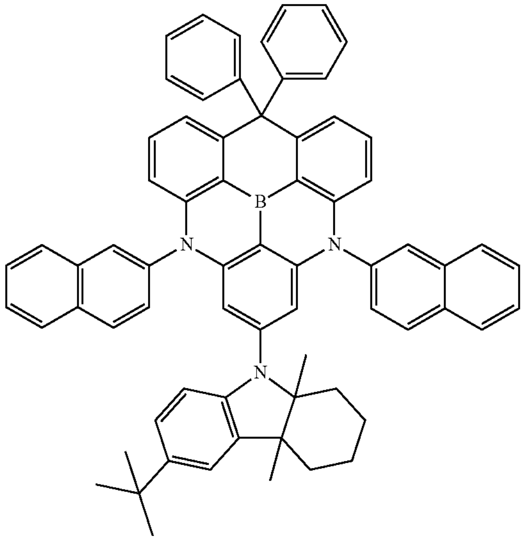
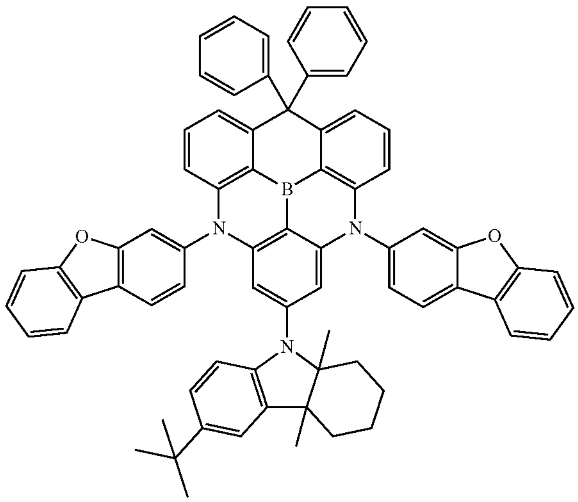
-continued
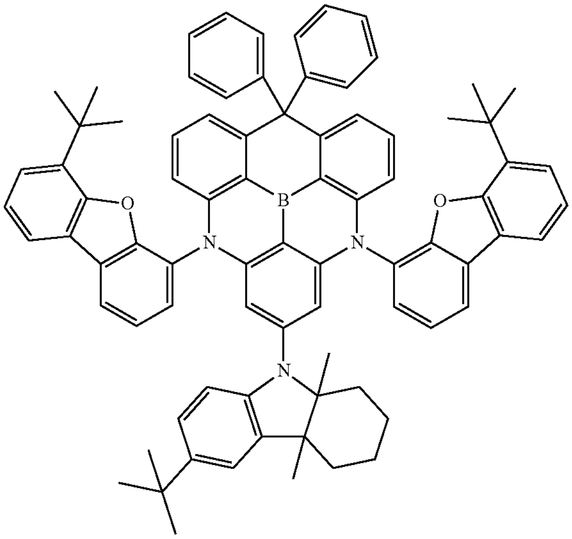
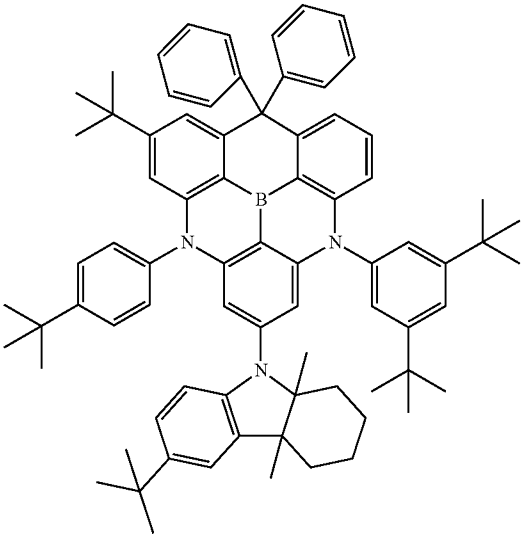
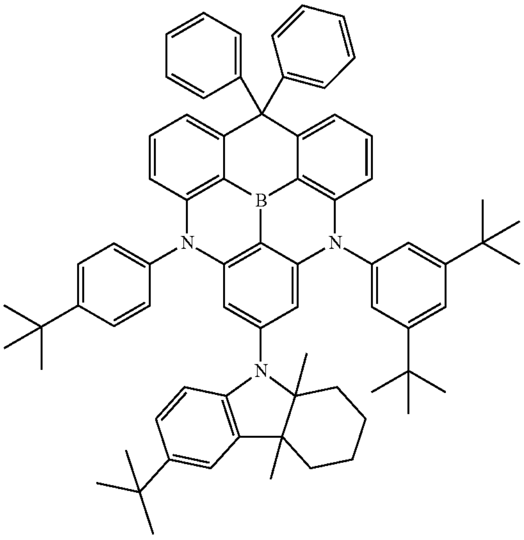

-continued
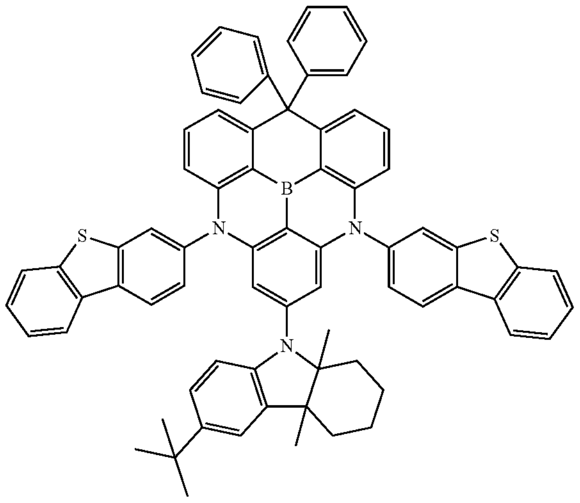
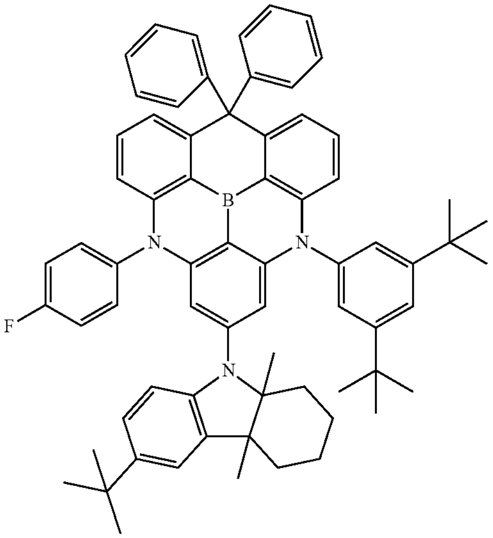
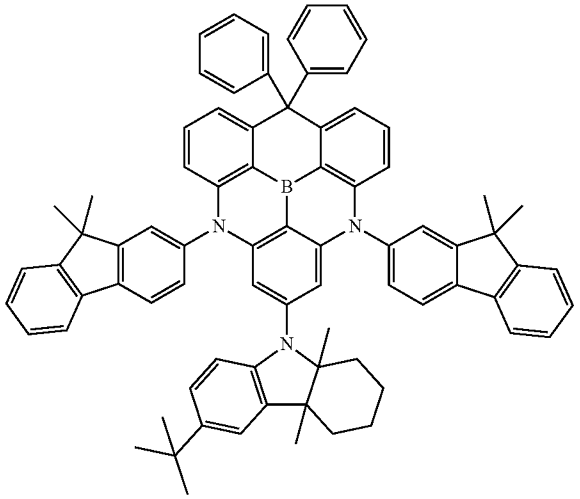
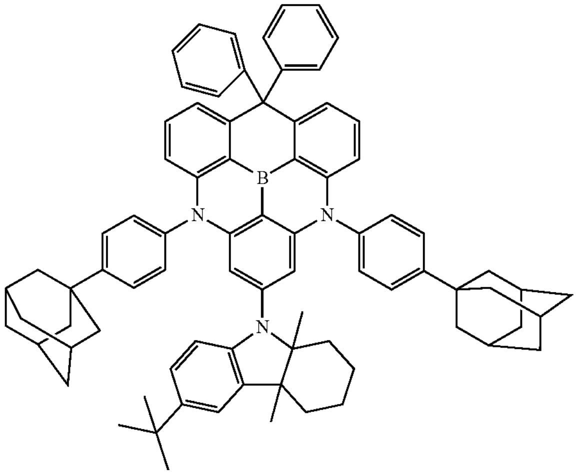
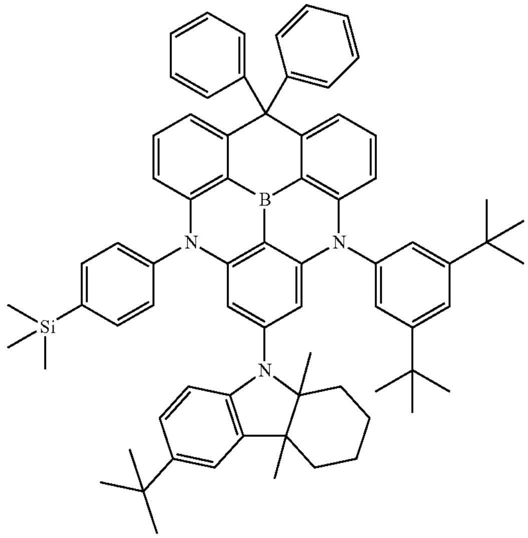
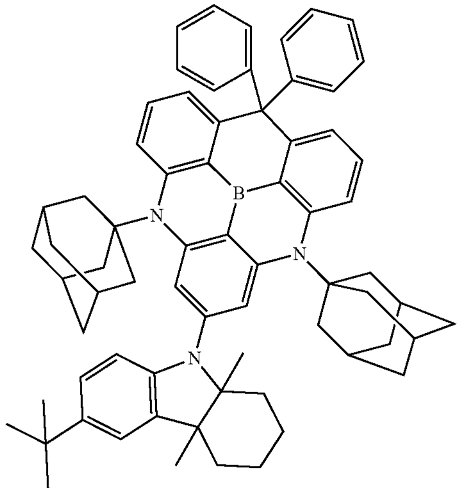
-continued -continued
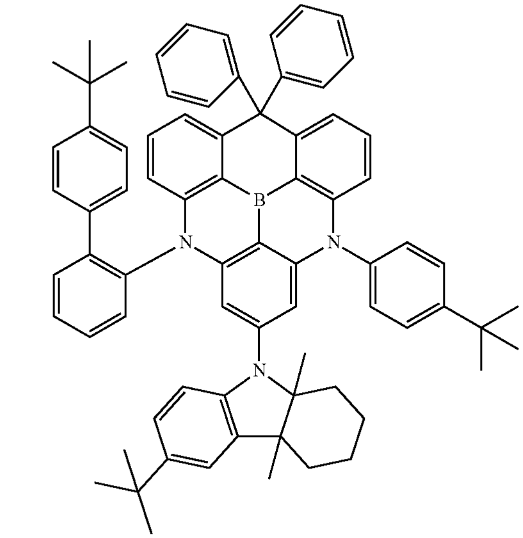
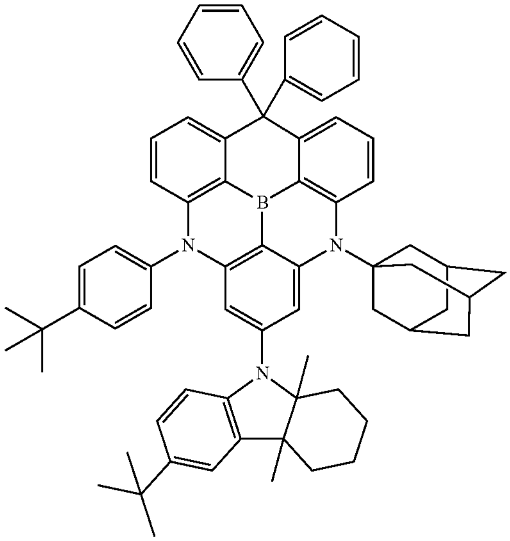
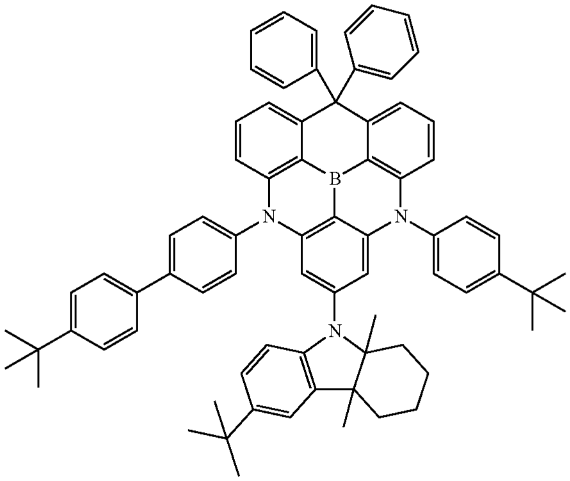
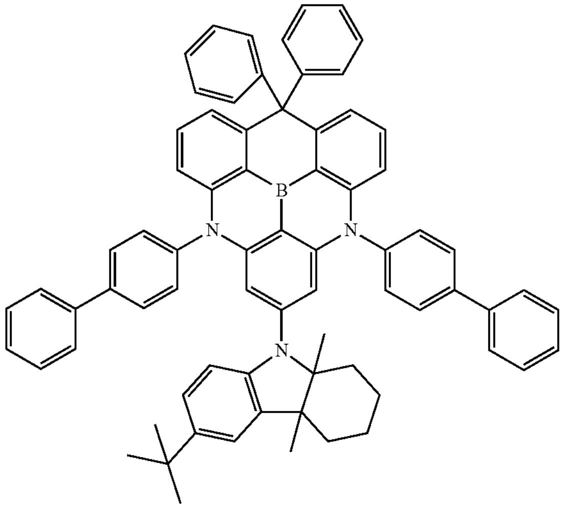
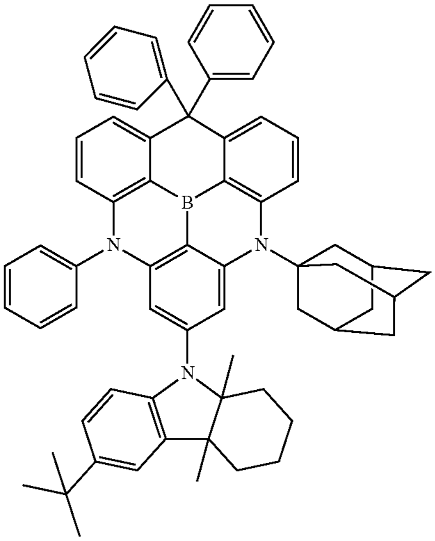
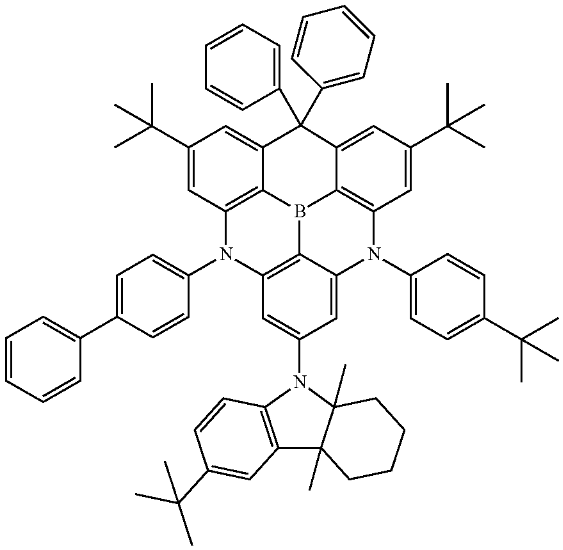

-continued
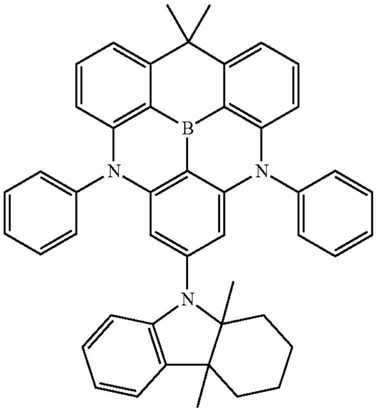
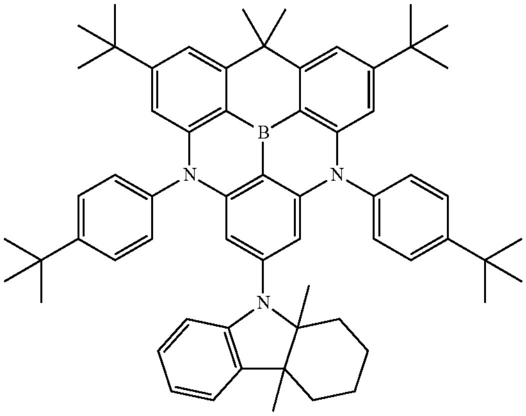
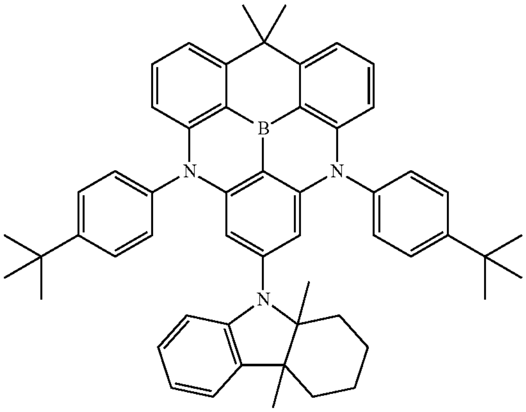
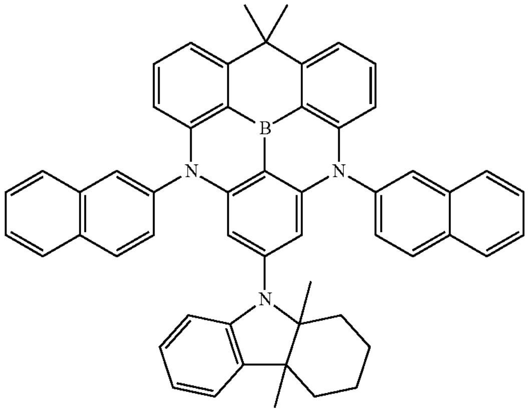
-continued
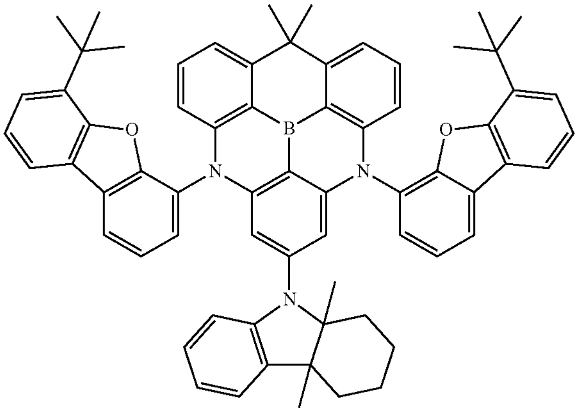
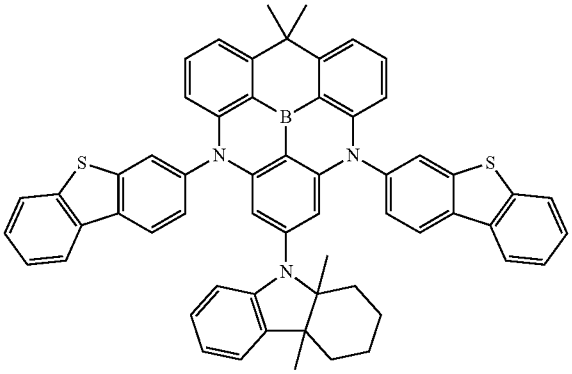
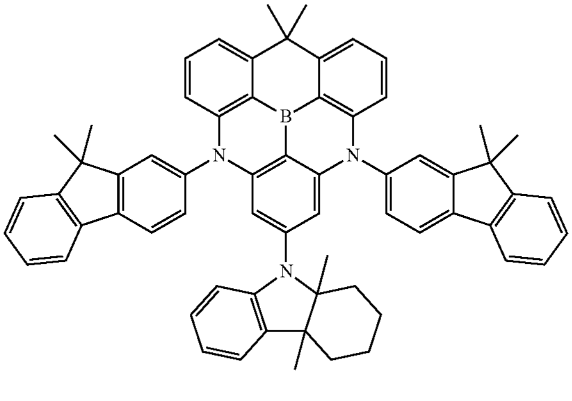
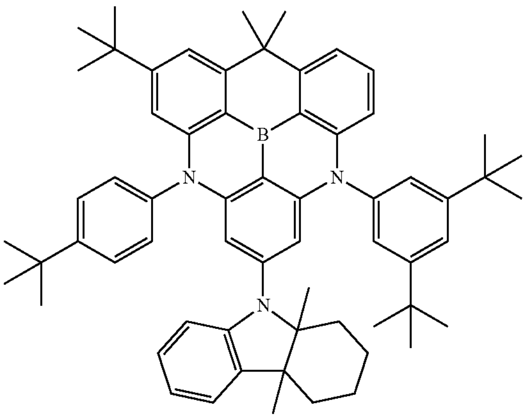

-continued
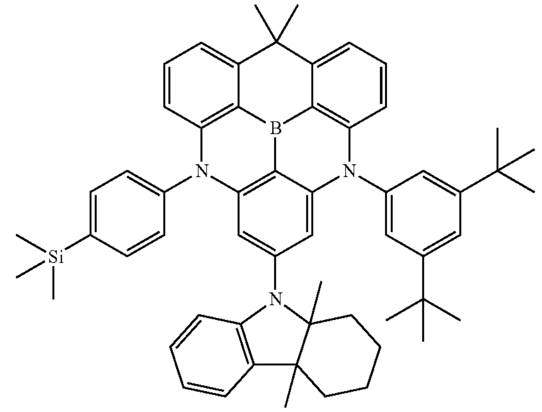
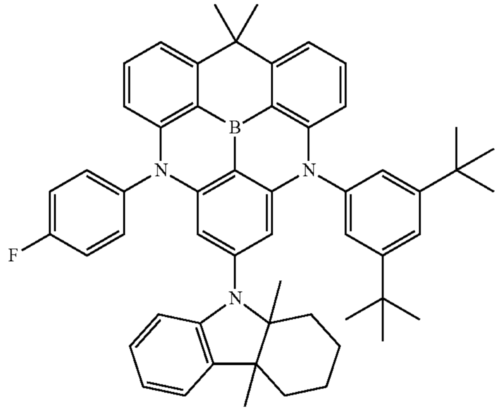
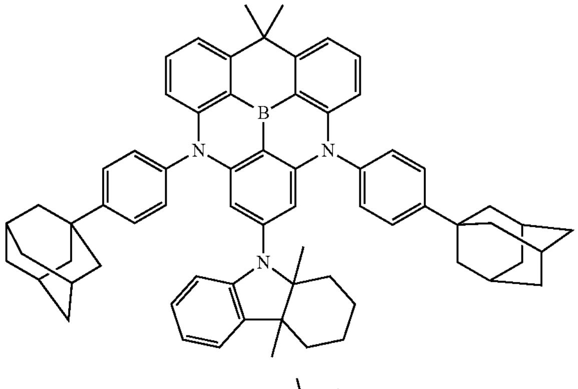
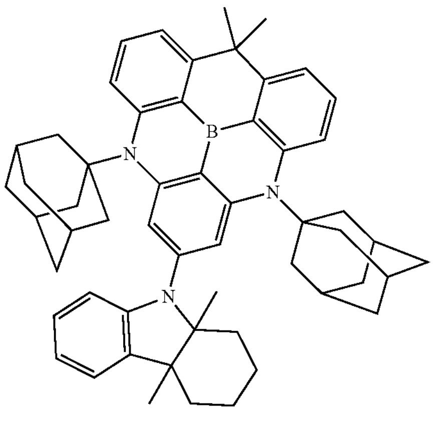
-continued
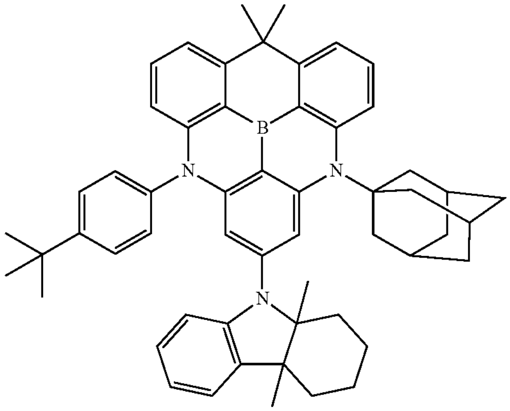
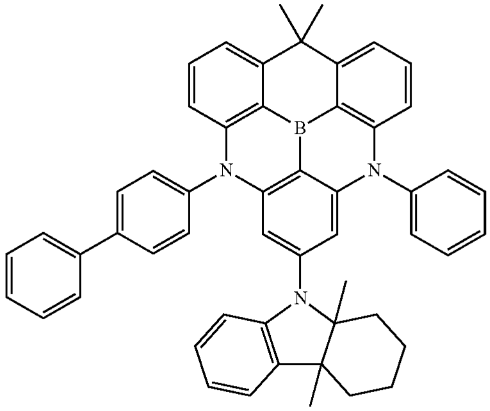
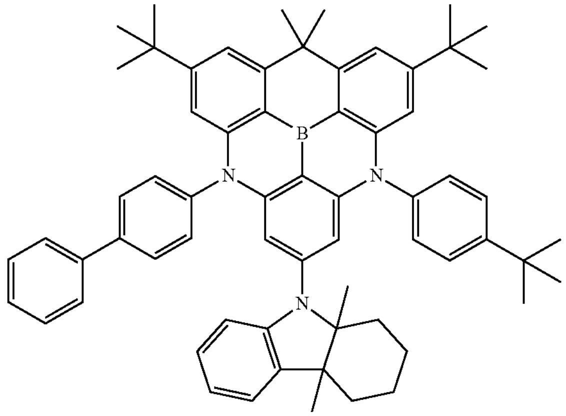
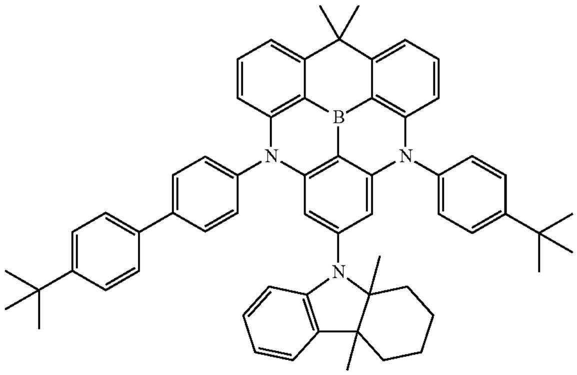

-continued
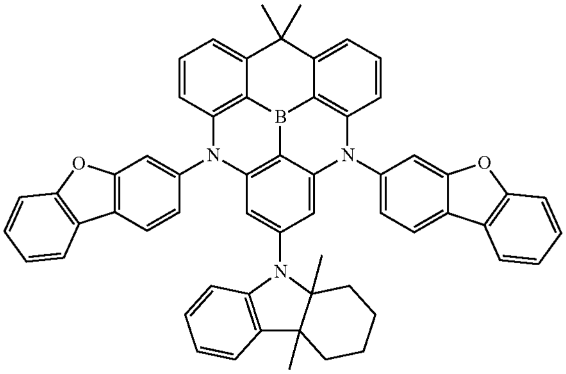
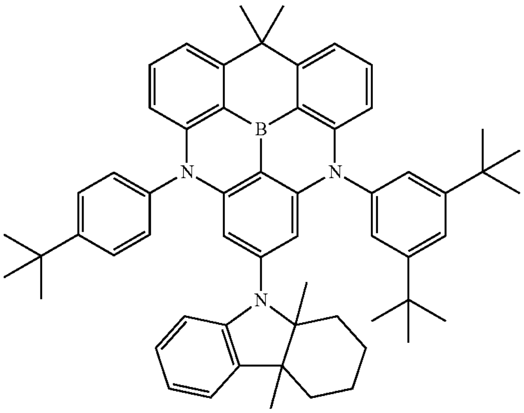
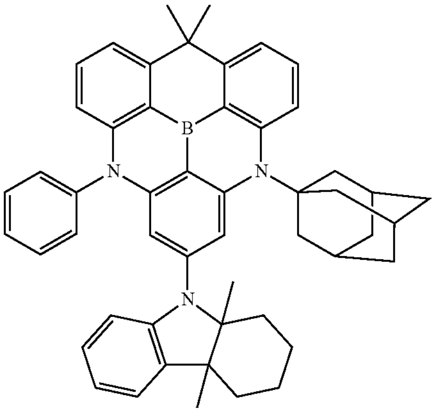
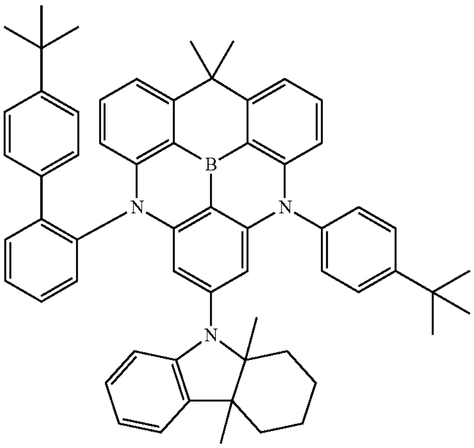
-continued
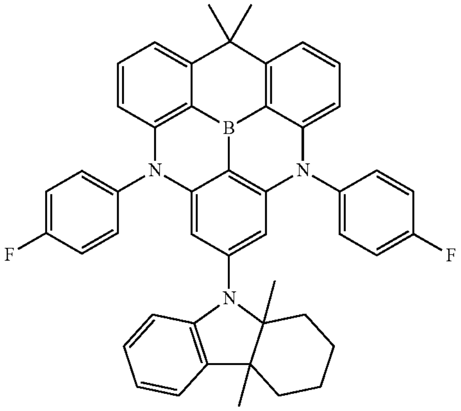
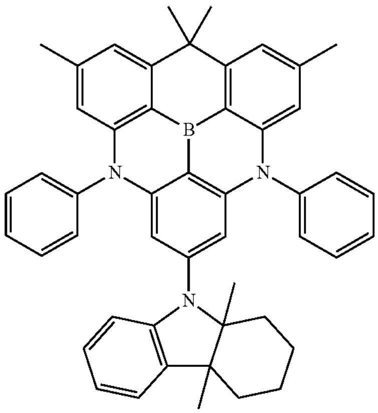
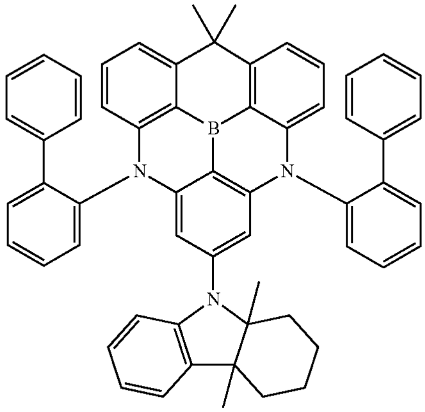
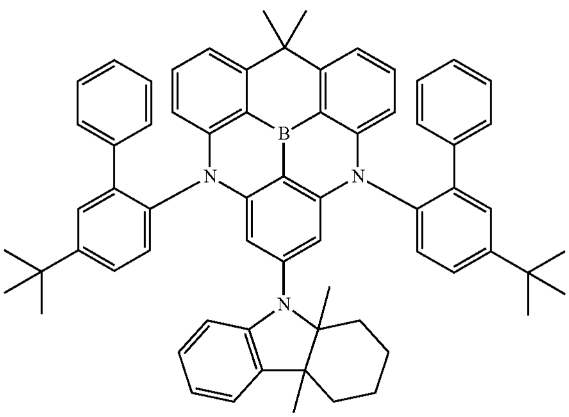

-continued
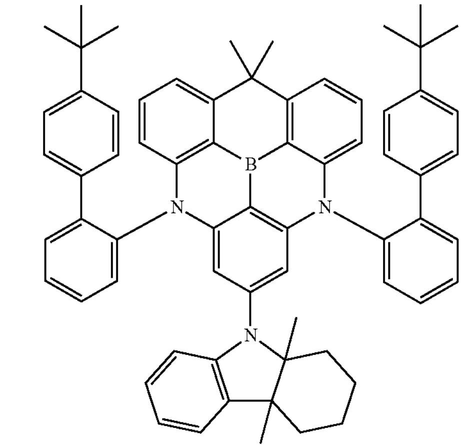
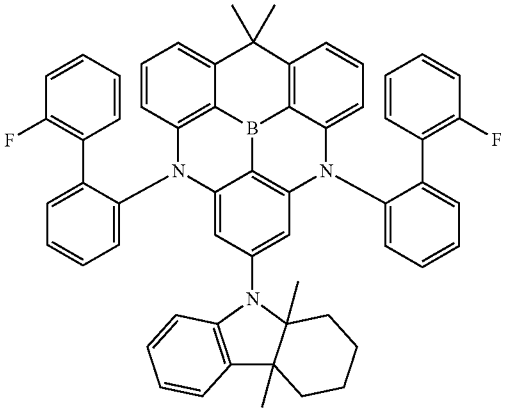
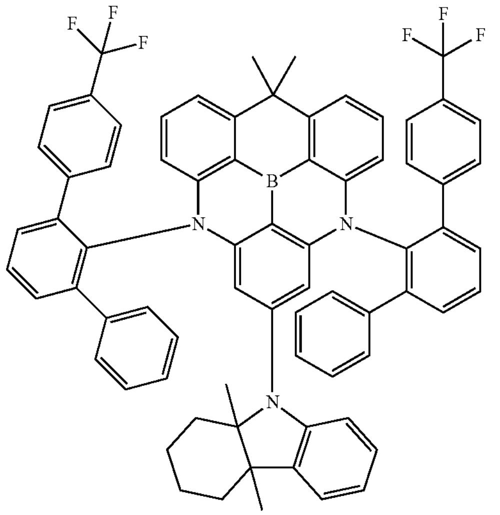
-continued
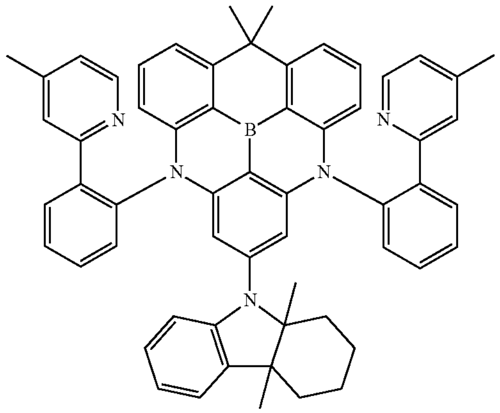
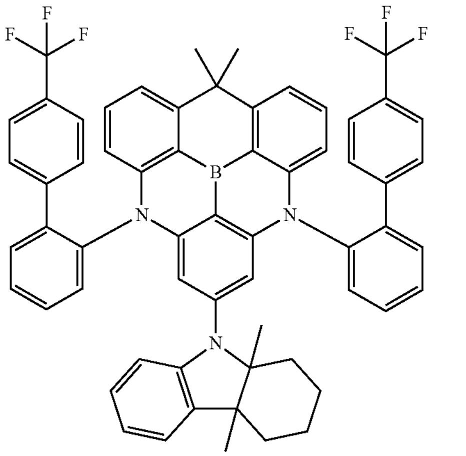
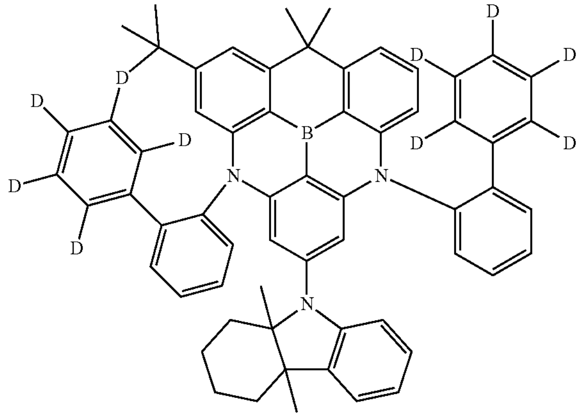
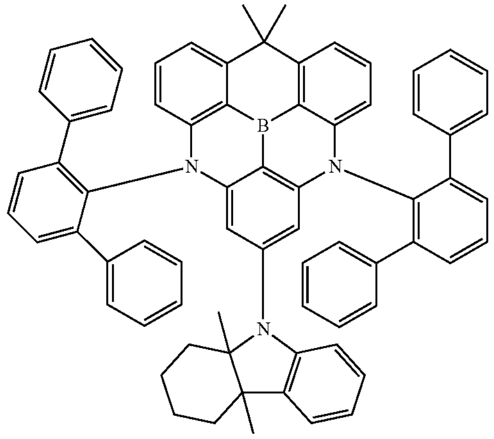

-continued
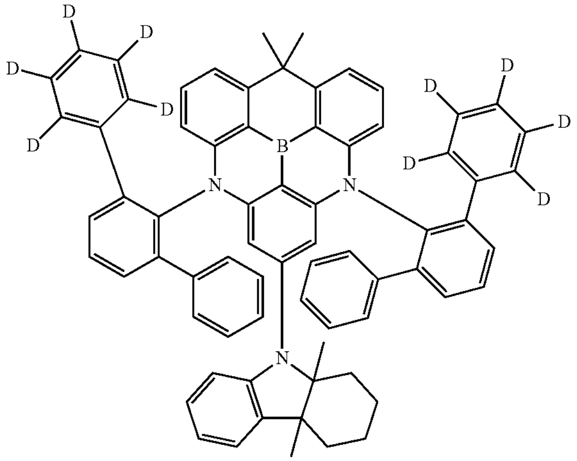
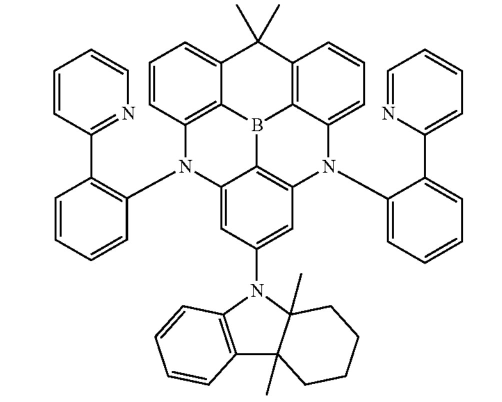
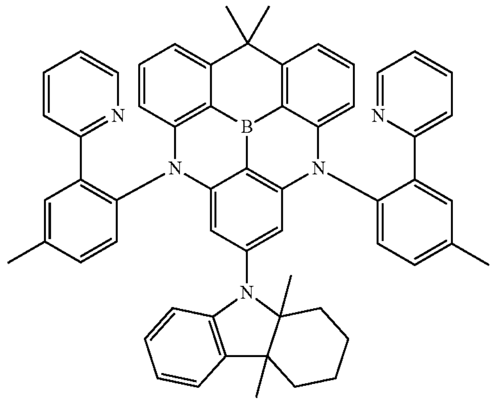
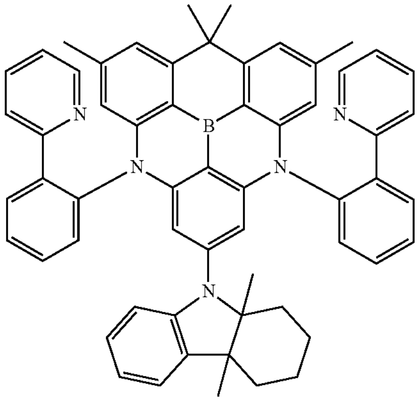
-continued
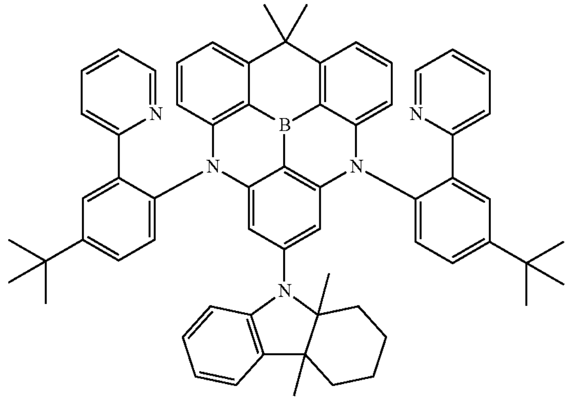
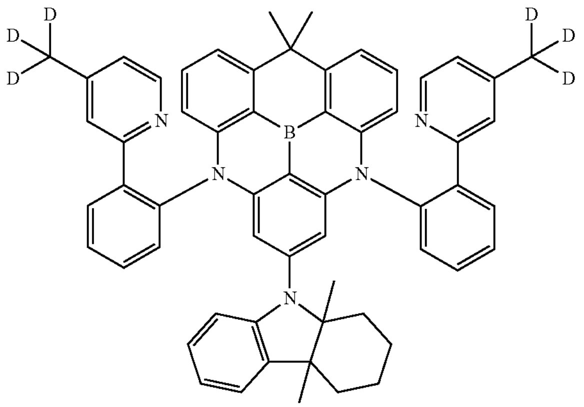
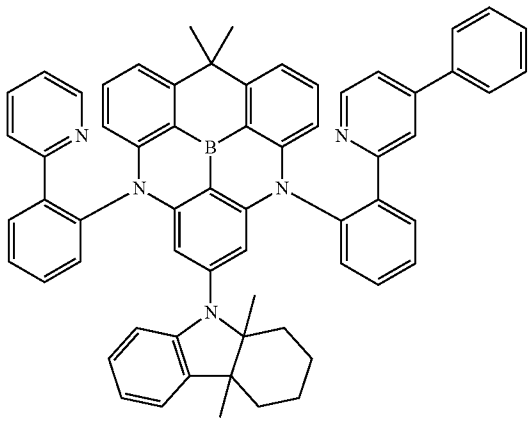
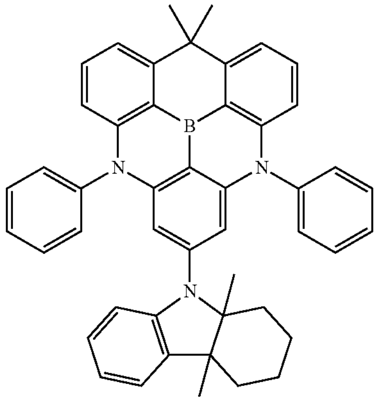

-continued
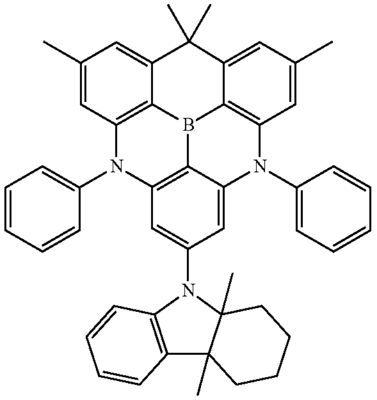
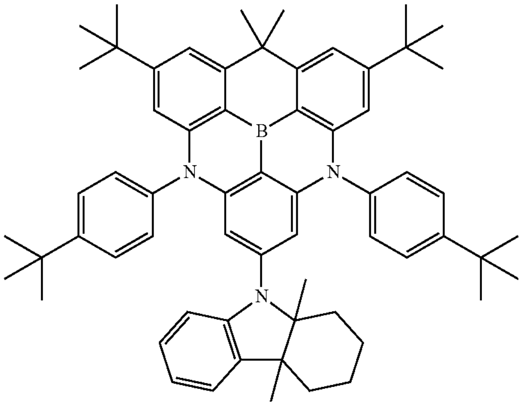
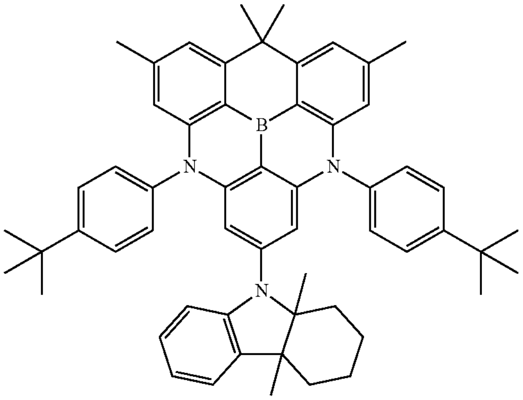
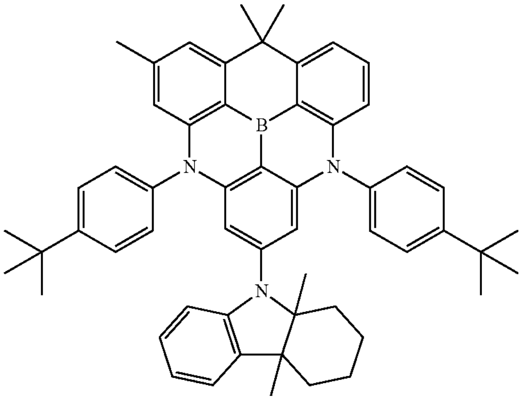
-continued
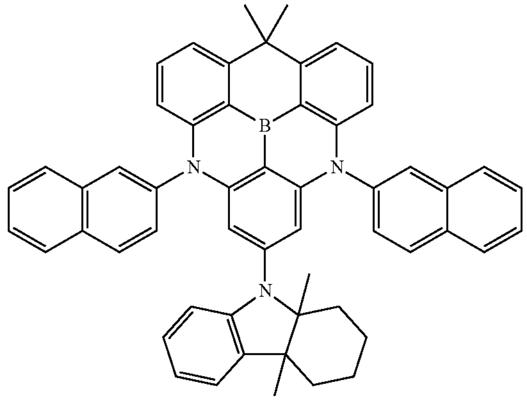
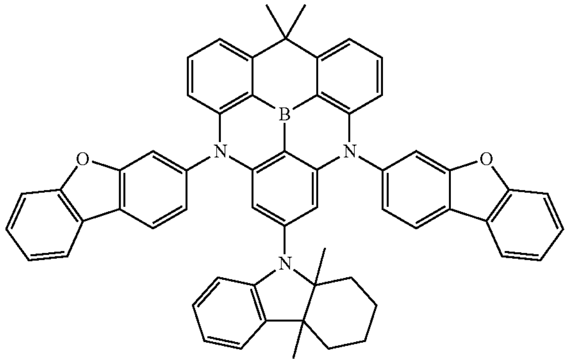
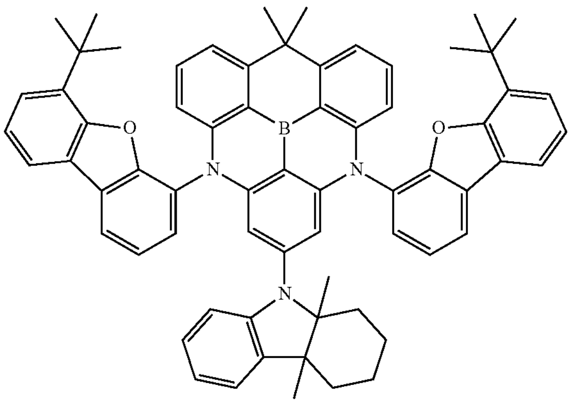
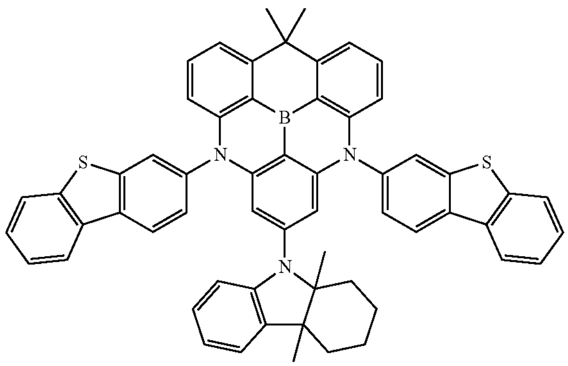

-continued
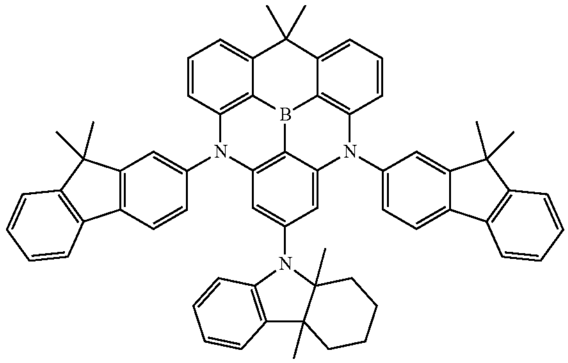
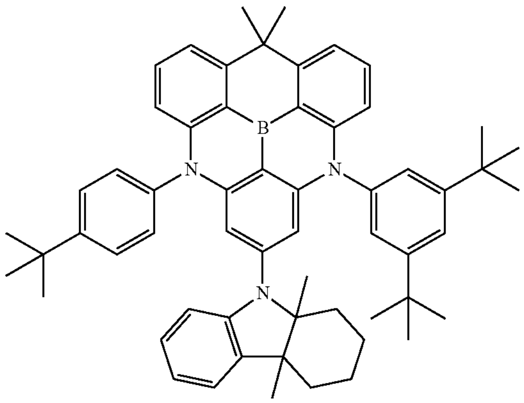
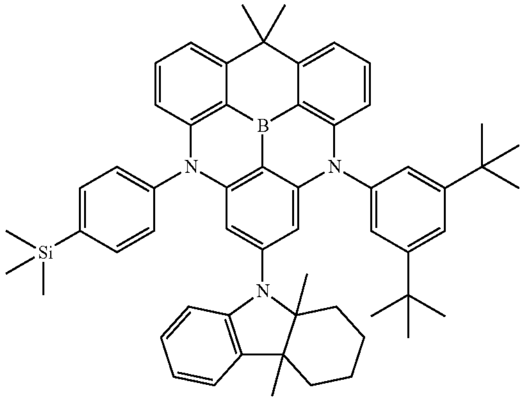
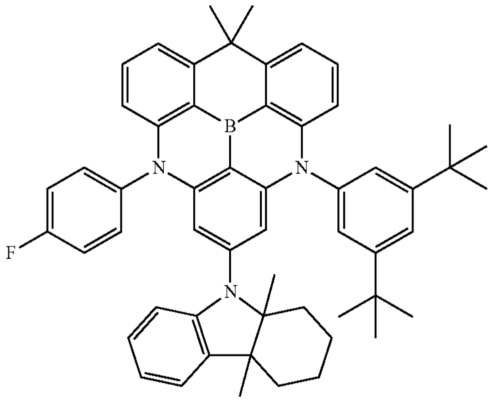
-continued
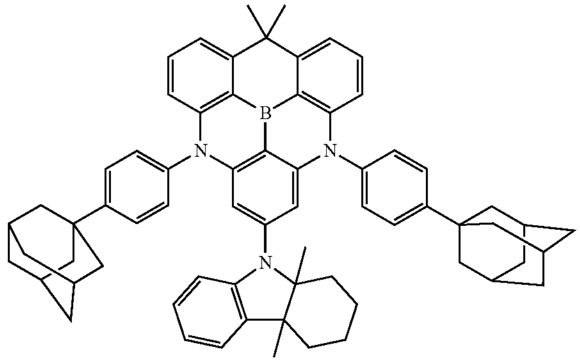
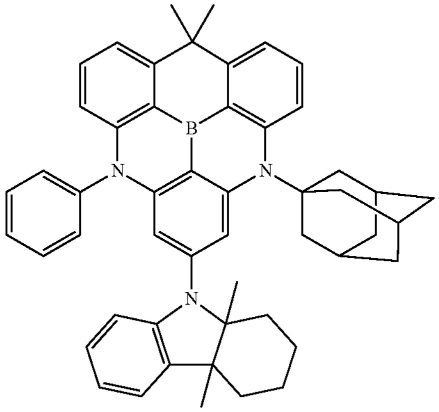
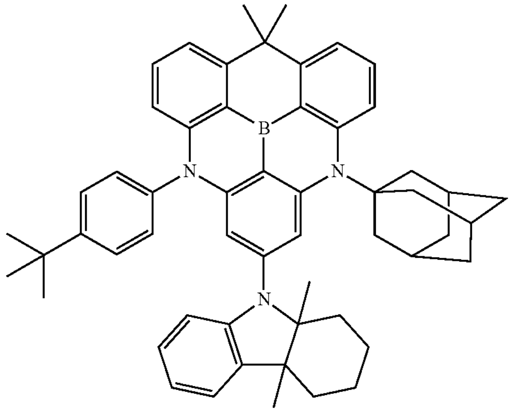
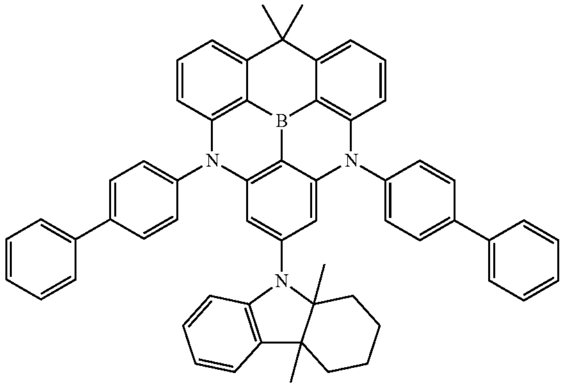

-continued
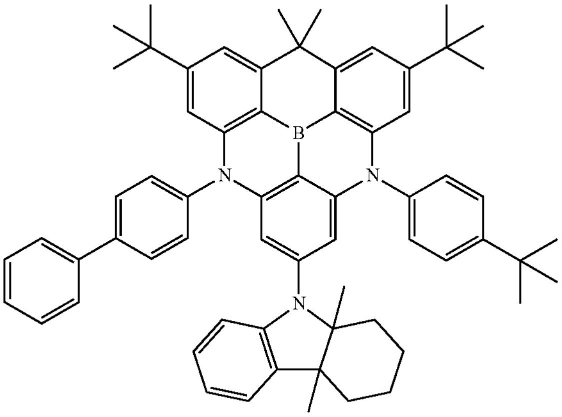
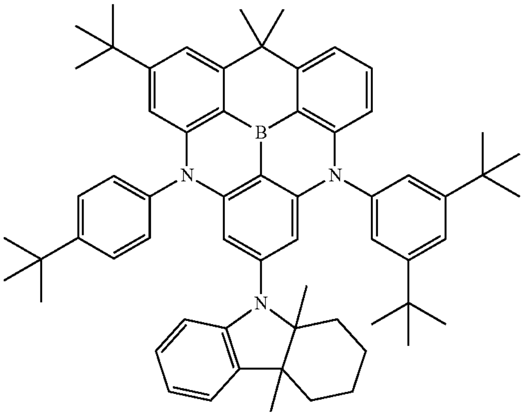
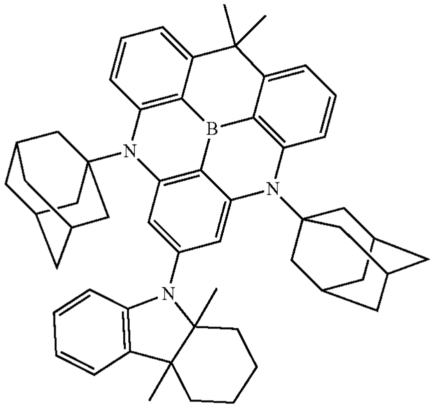
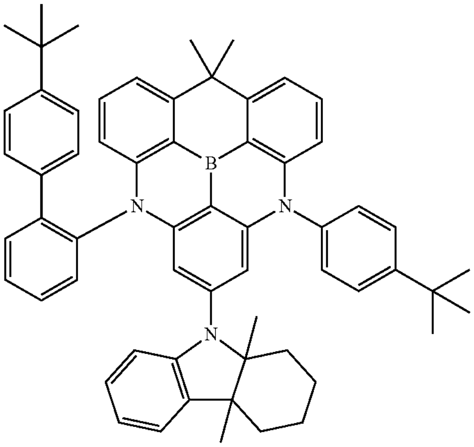
-continued
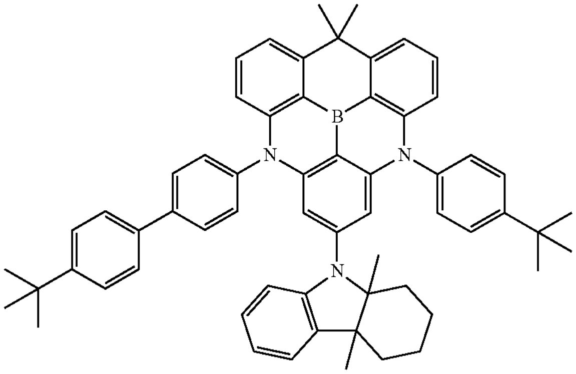
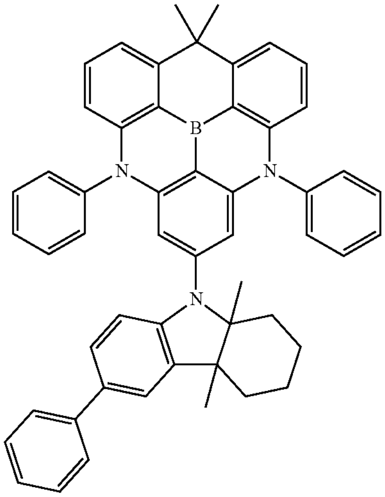
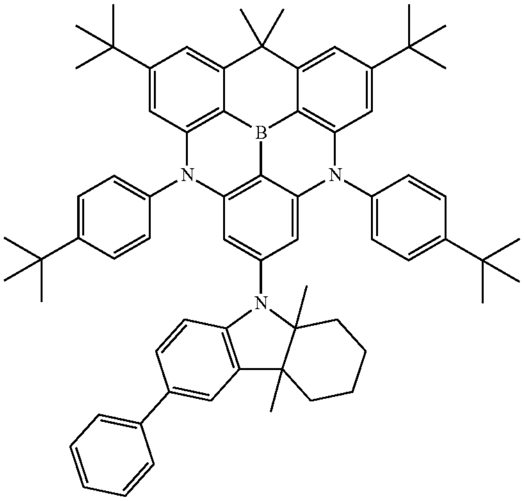

-continued
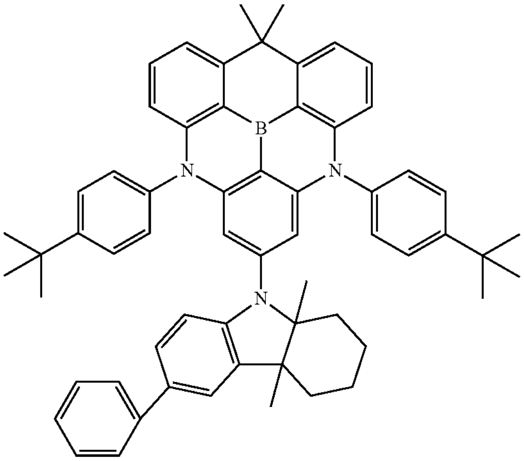
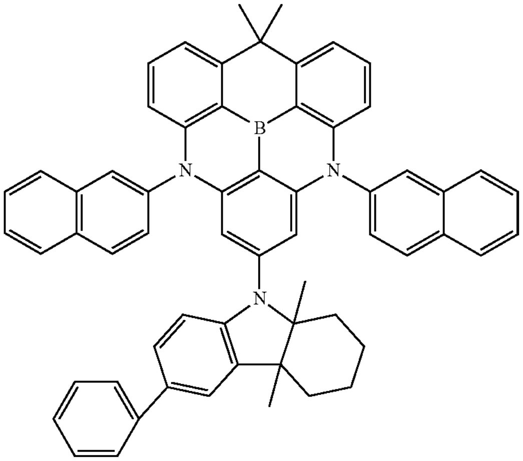
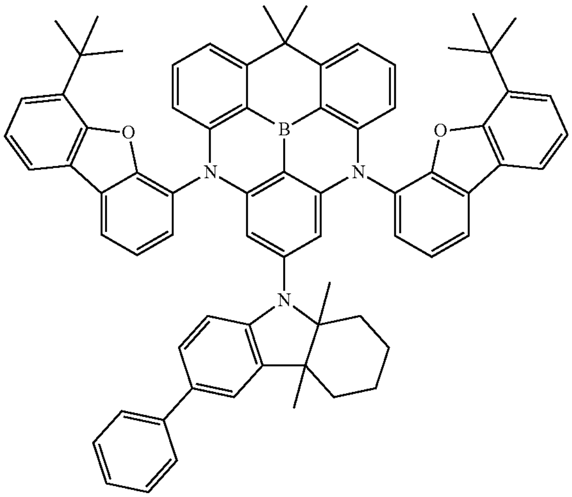
-continued
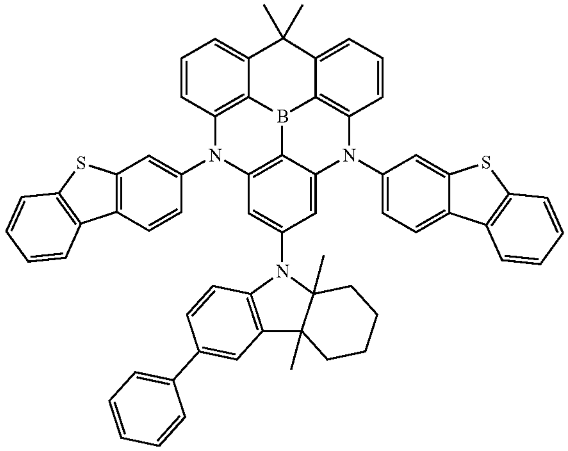
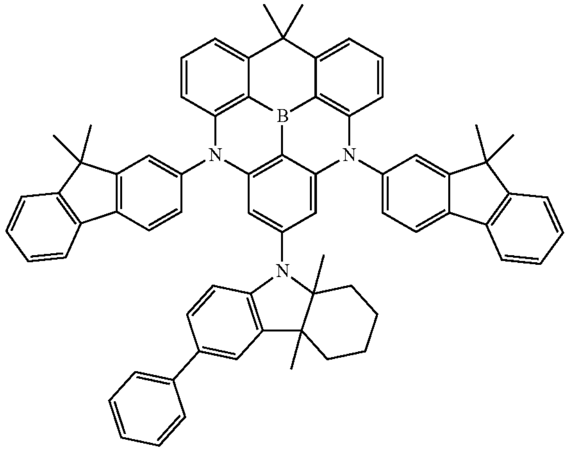
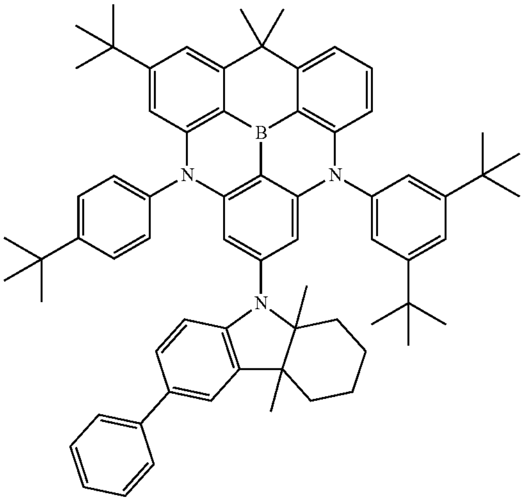

-continued
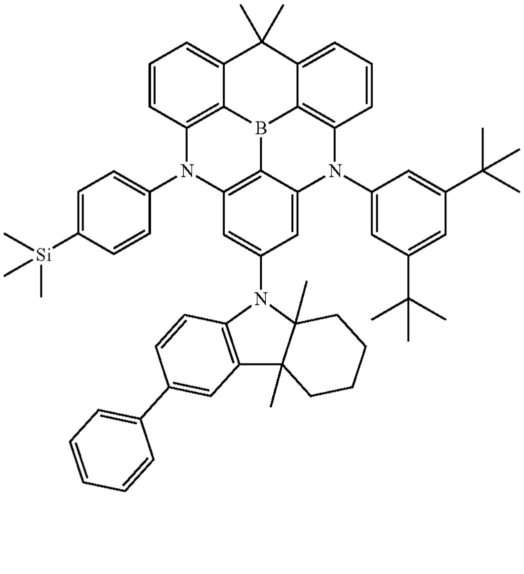
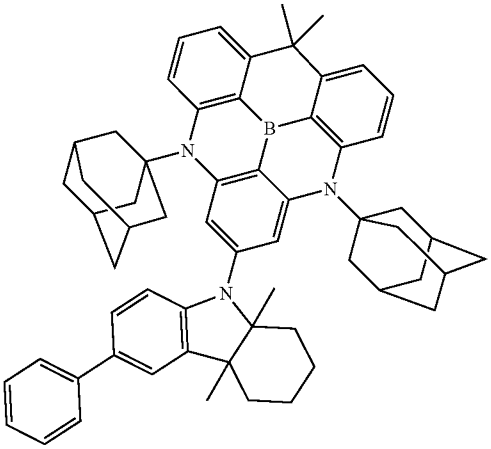
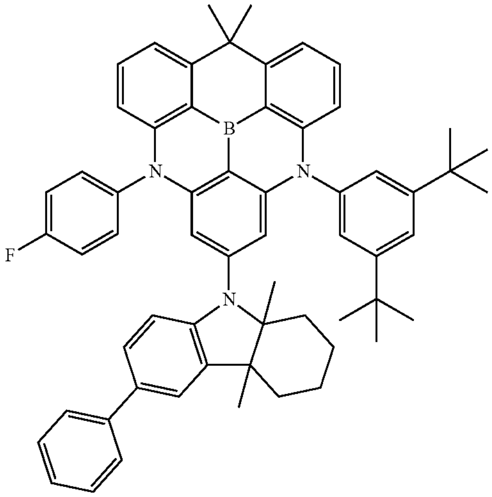
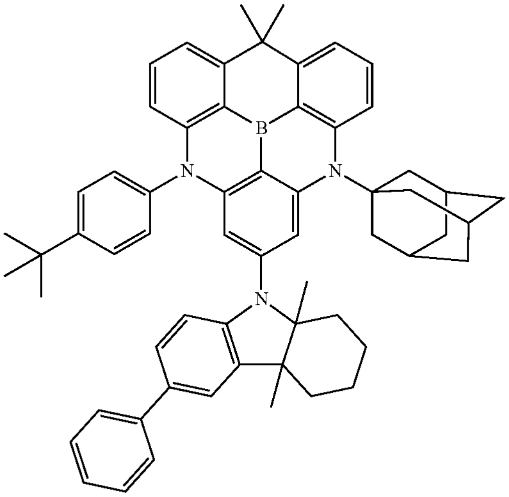
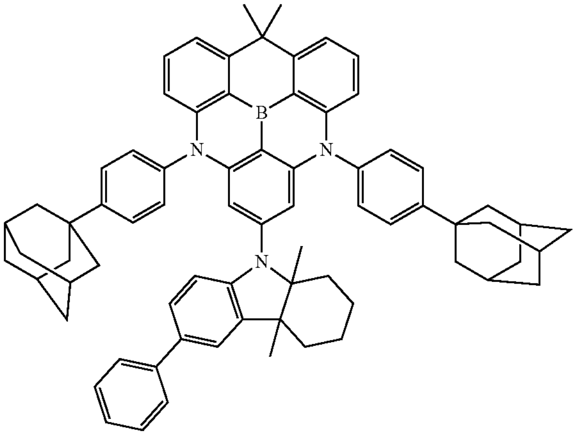
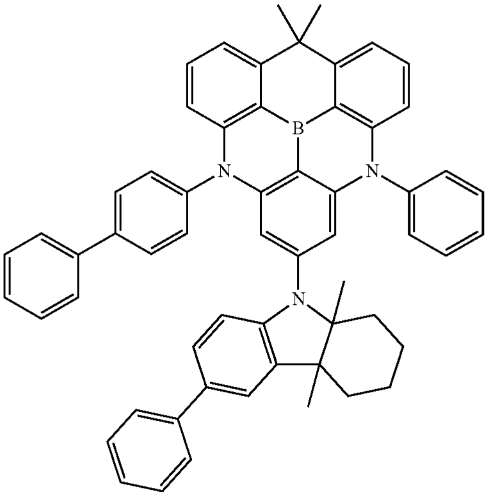

-continued
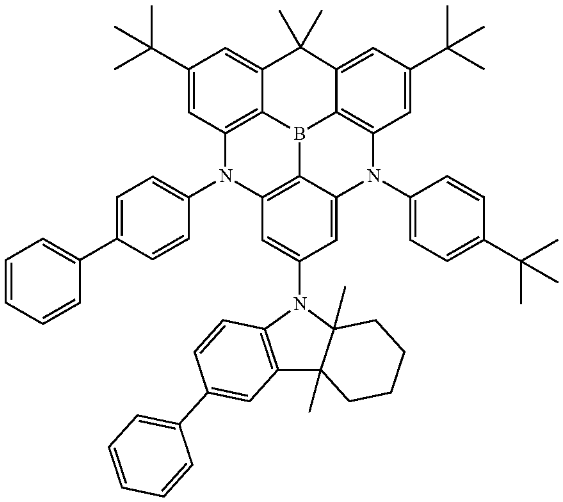
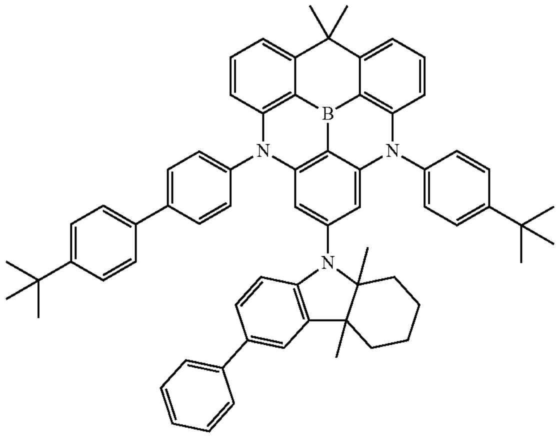
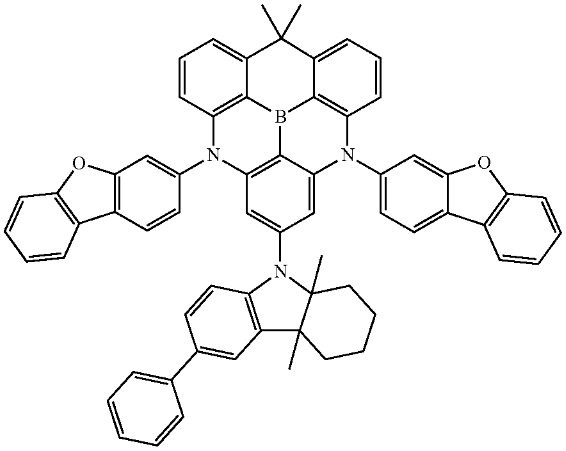
-continued
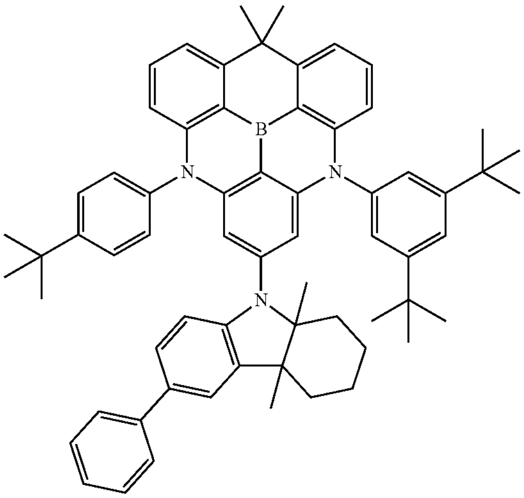
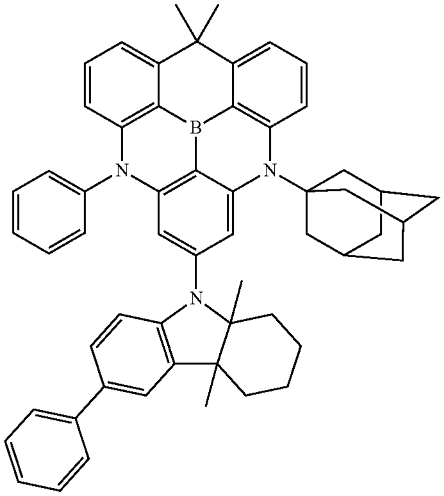
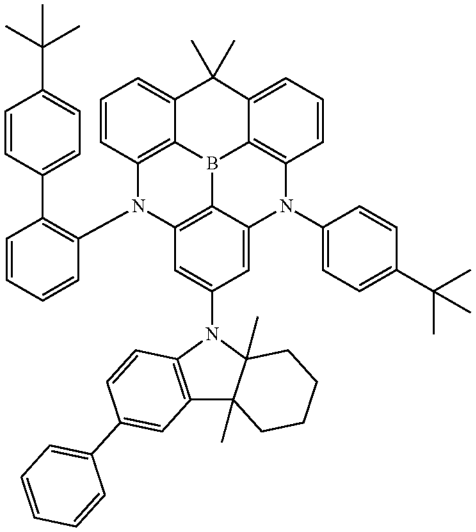 [SMILES: CC(C)(C)c1ccc(-c2ccccc2N2c3cc(N4c5ccc(-c6ccccc6)cc5C5(C)CCCCC45C)cc4c3B3c5c(cccc5C(C)(C)c5cccc2c53)N4c2ccc(C(C)(C)C)cc2)cc1]

-continued
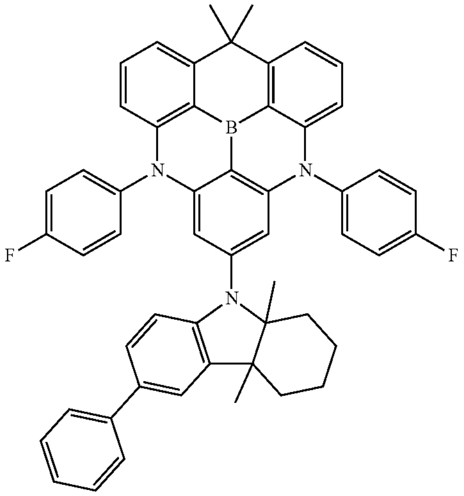
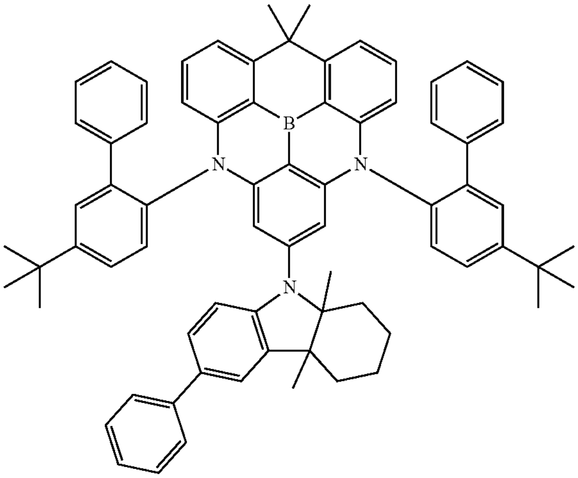
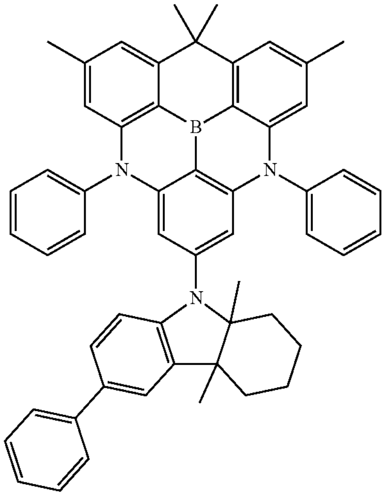
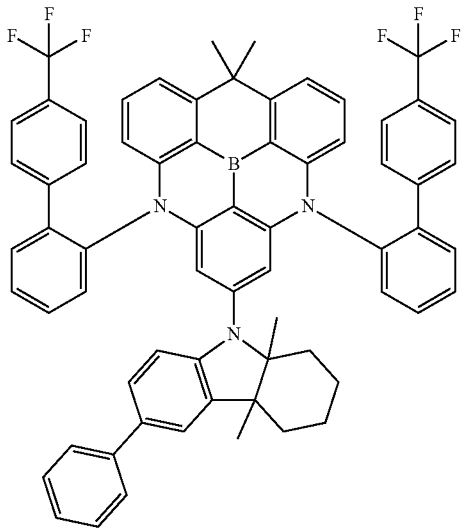
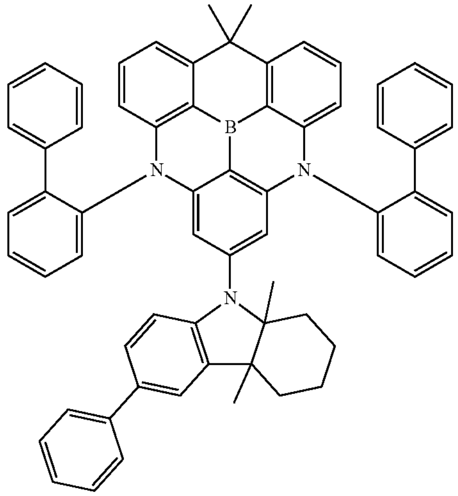
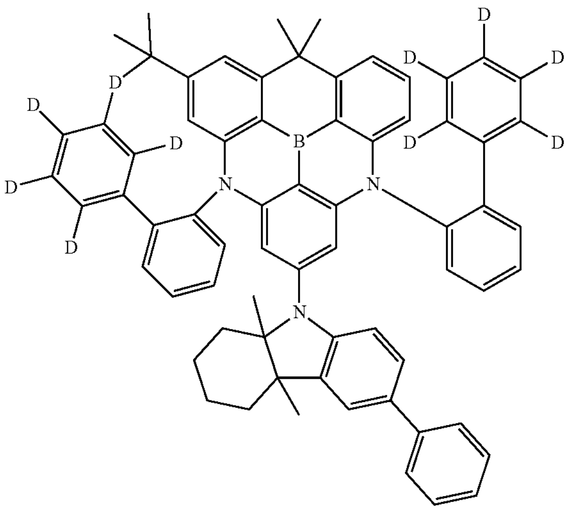

-continued
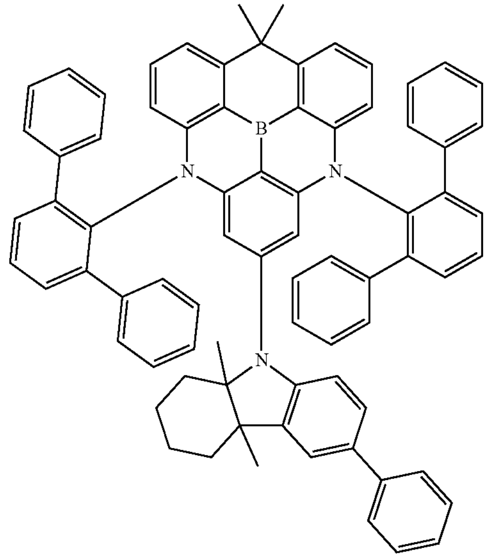
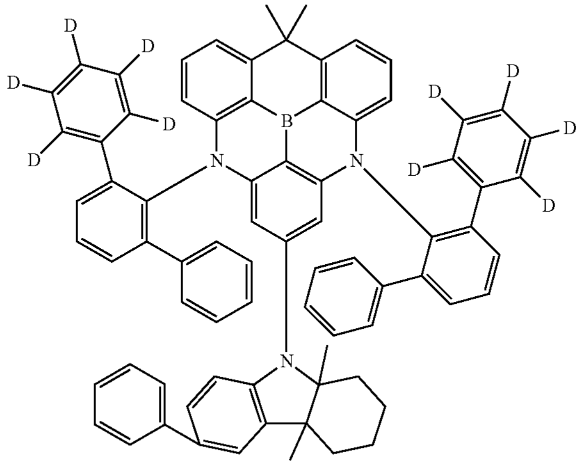
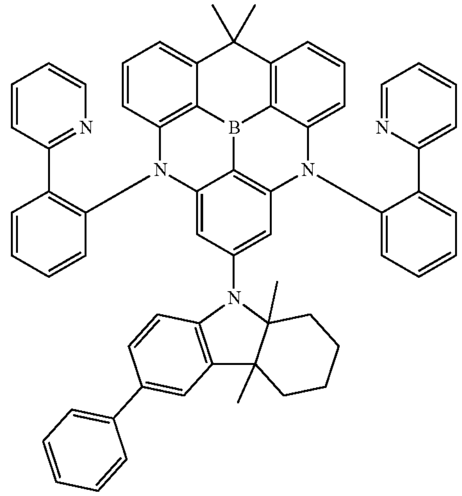
-continued
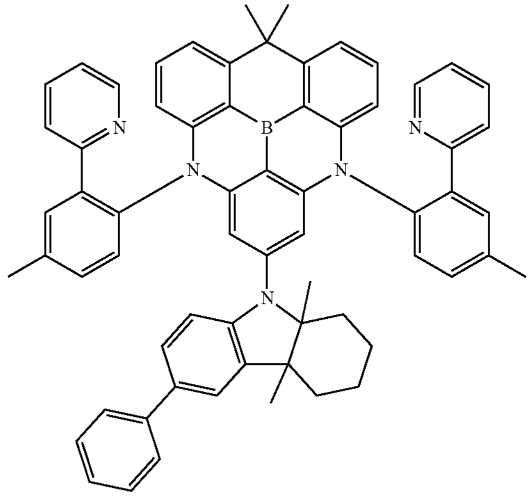
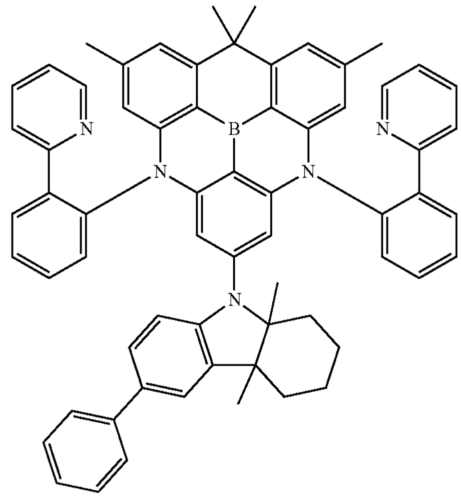
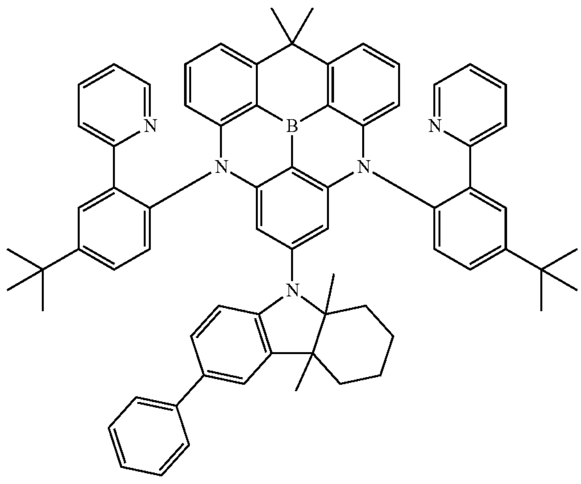

-continued
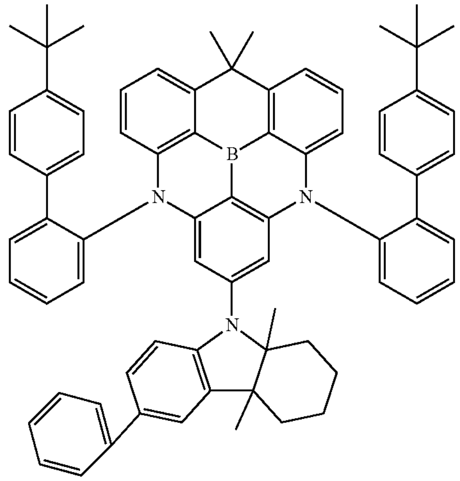
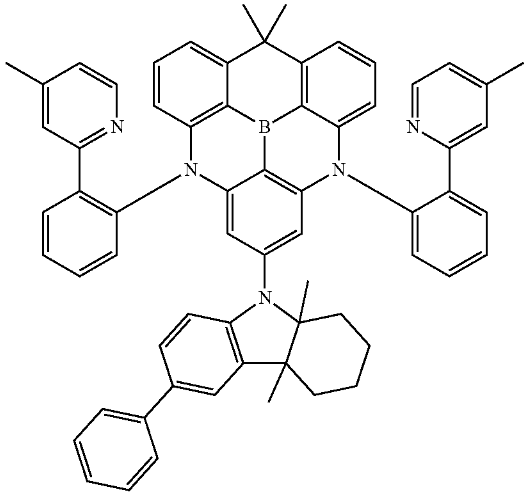
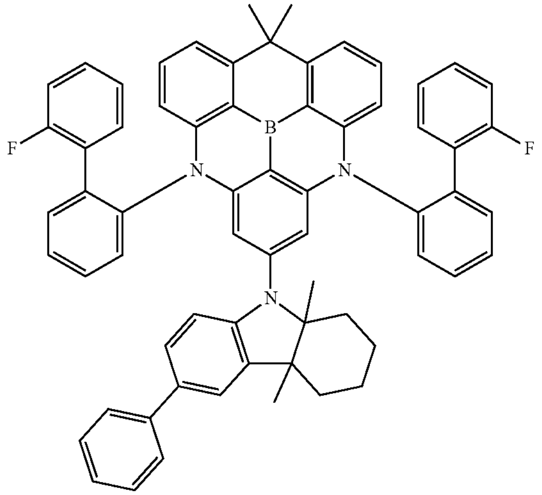
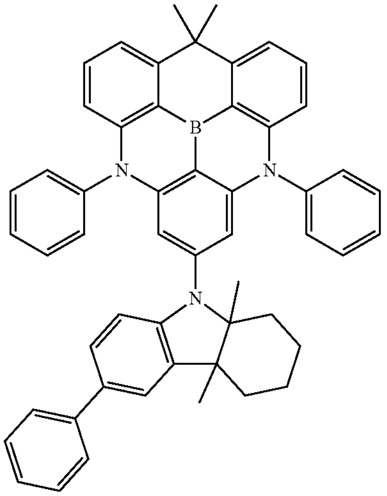
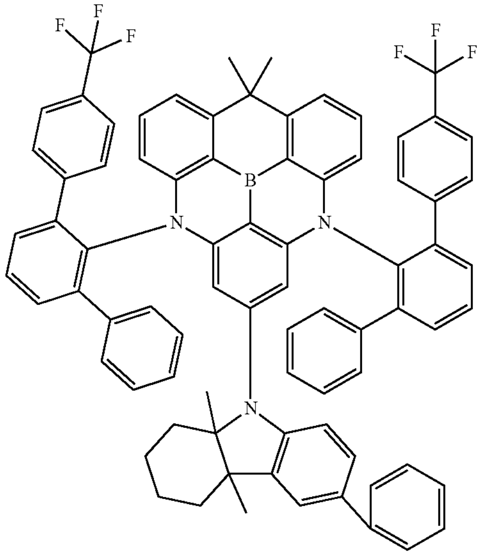
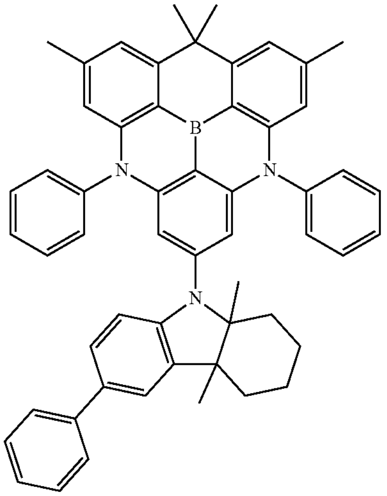

-continued
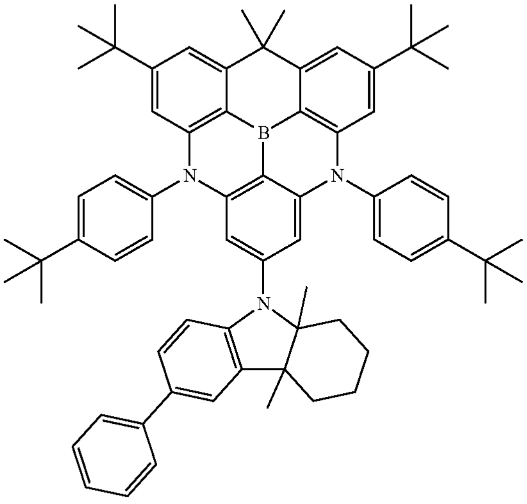
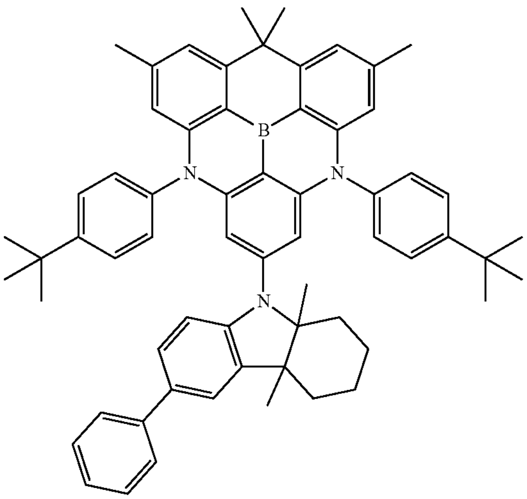
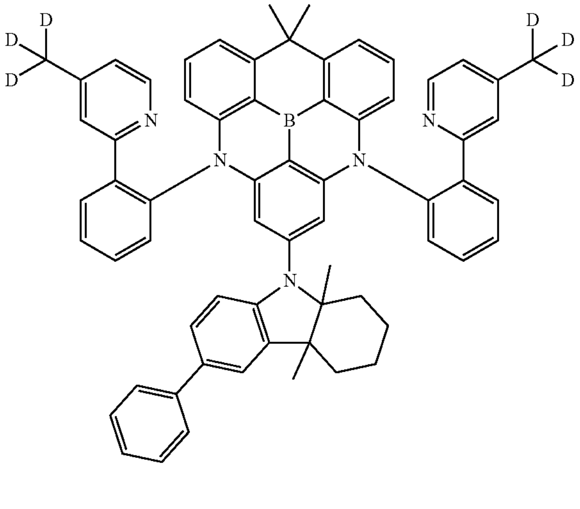
-continued
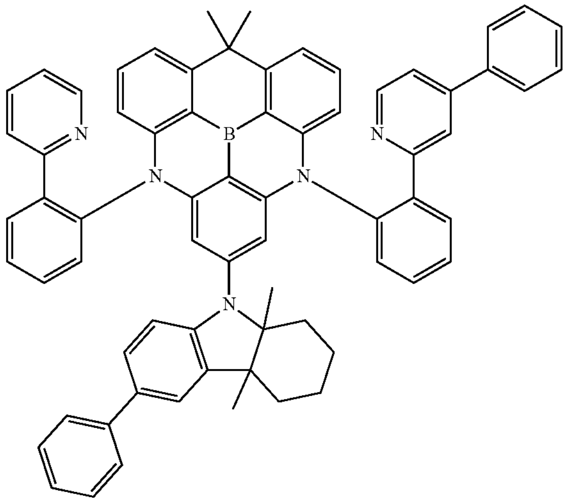
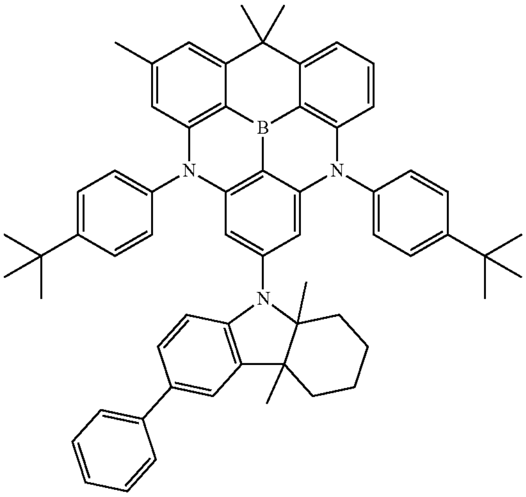
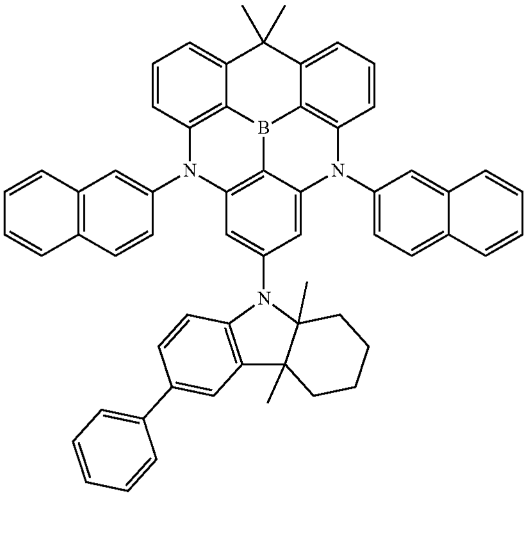

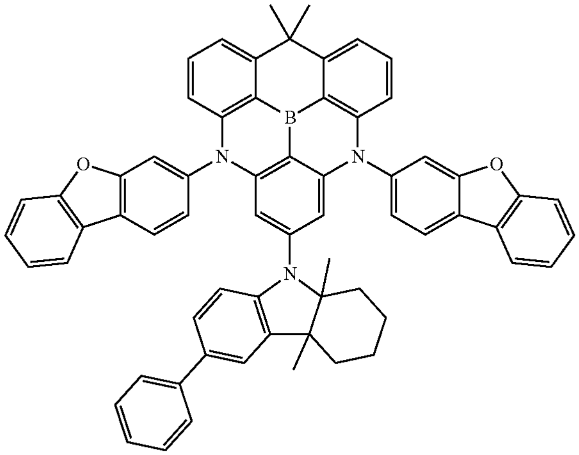
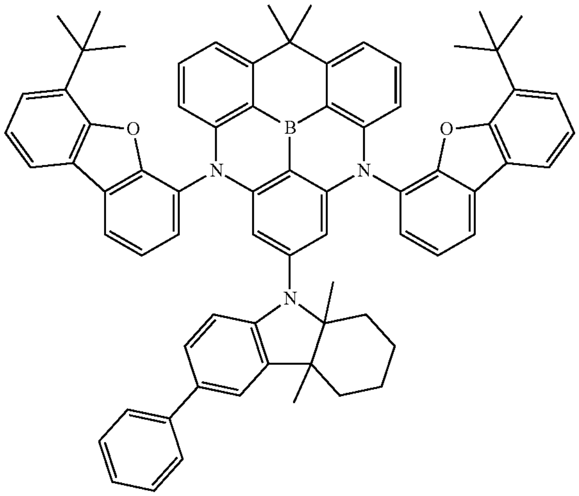
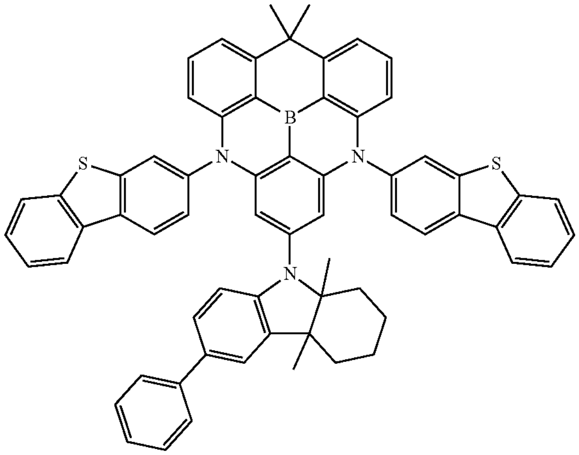
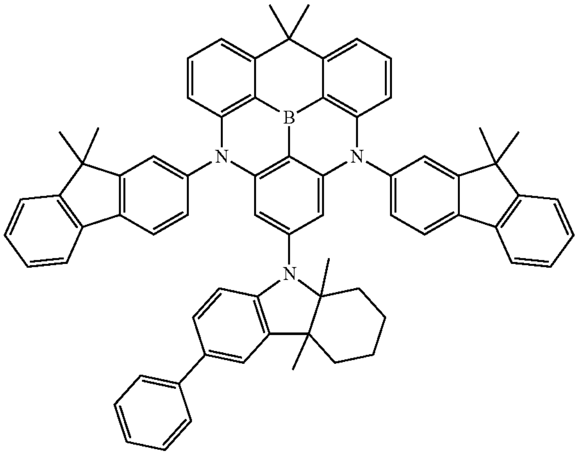
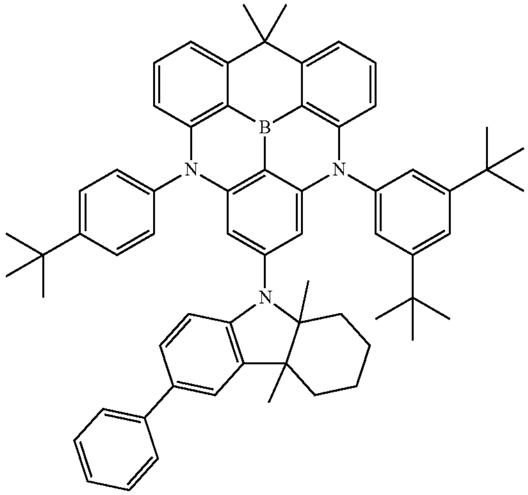
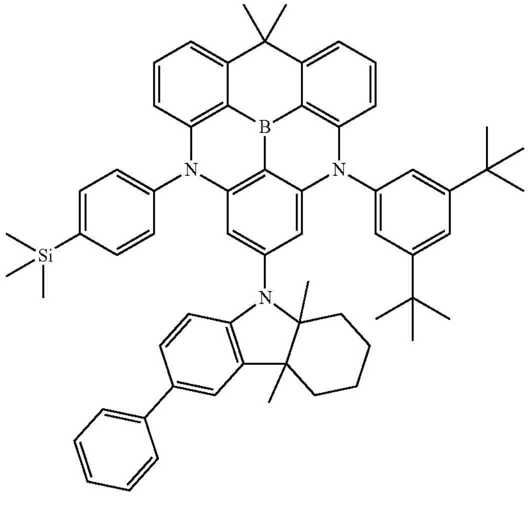

-continued
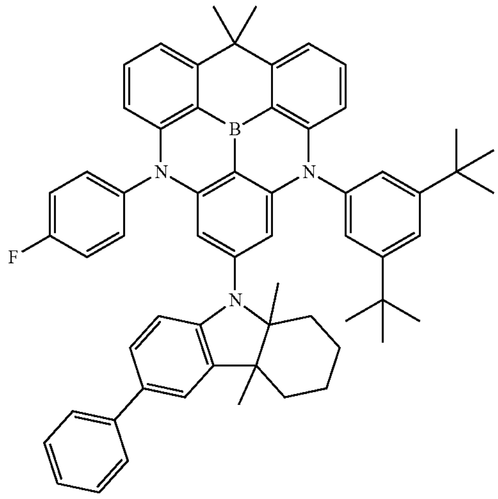
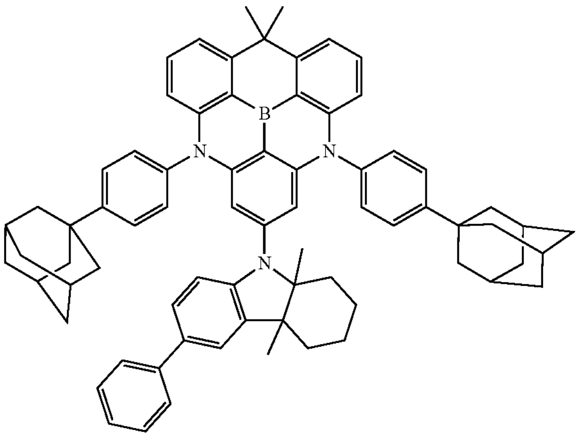
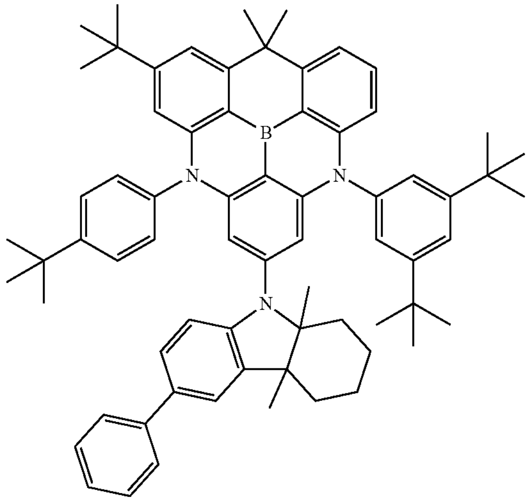
-continued
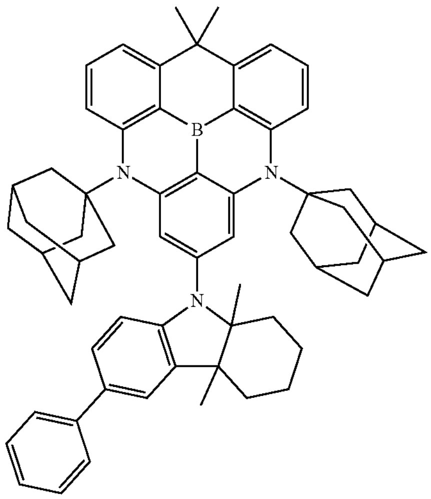
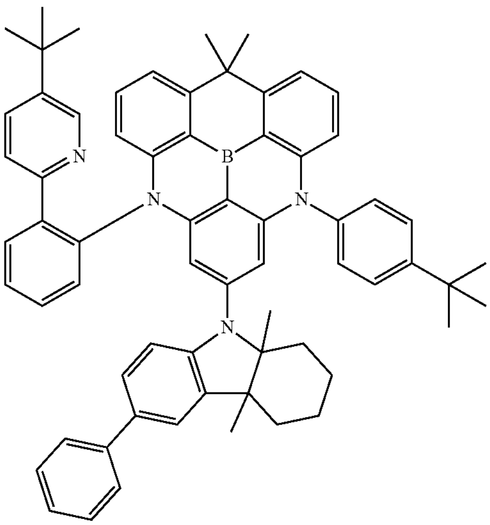
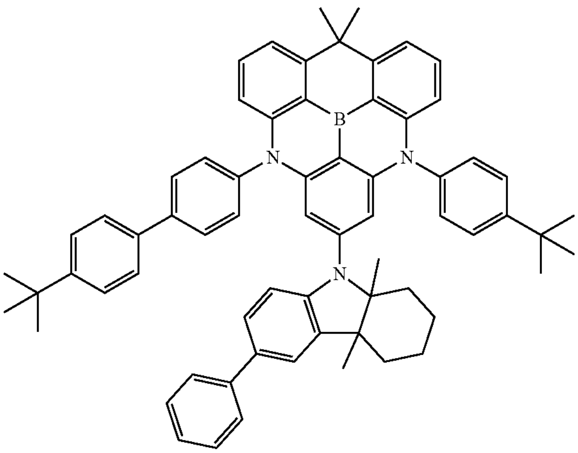

-continued
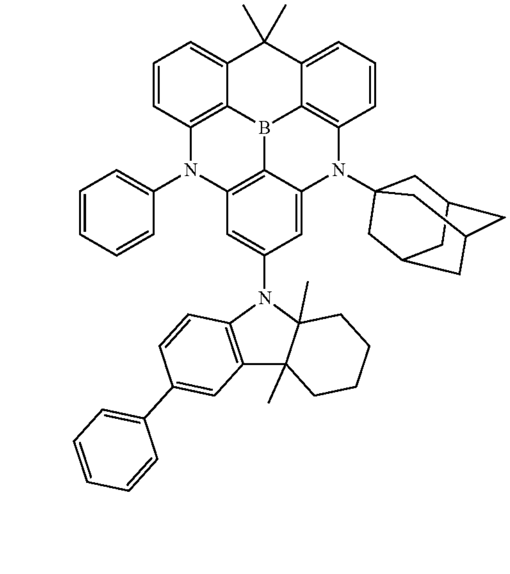
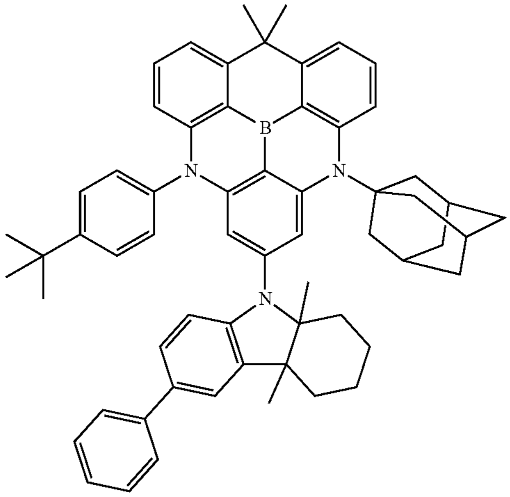
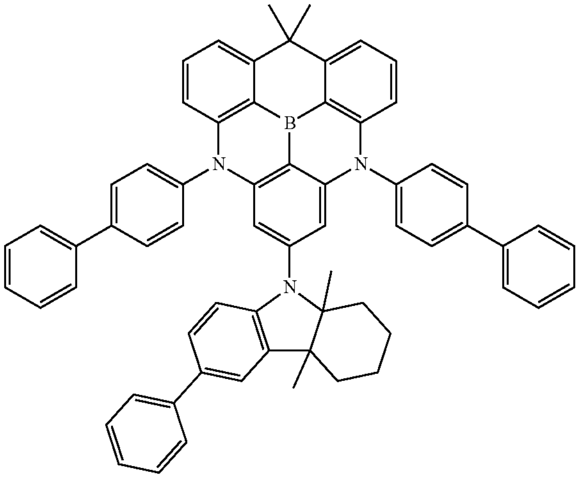
-continued
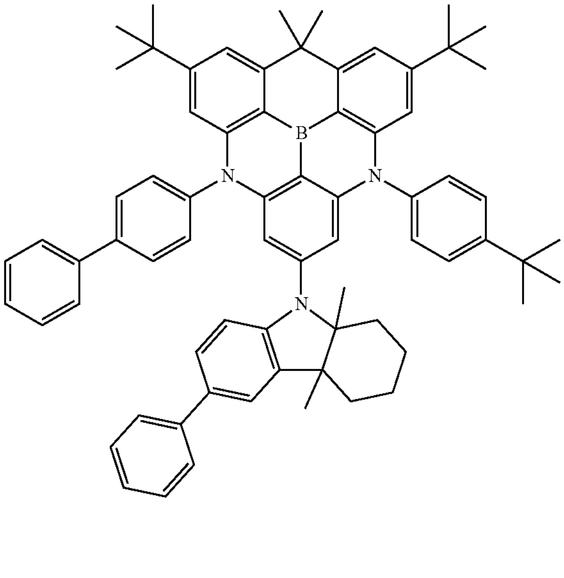
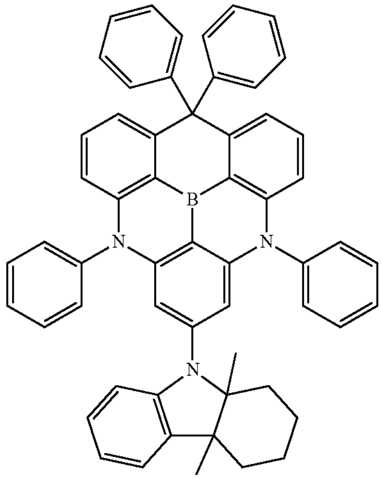
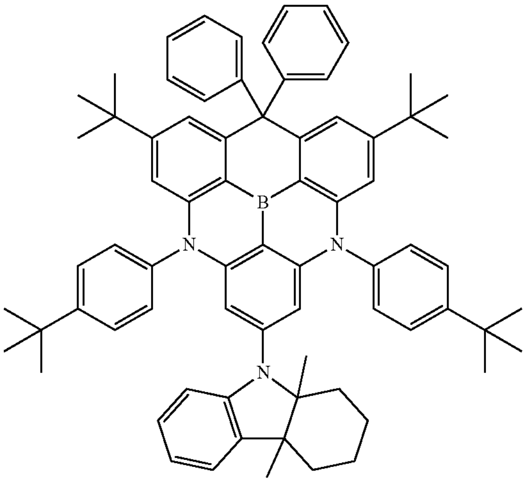

-continued
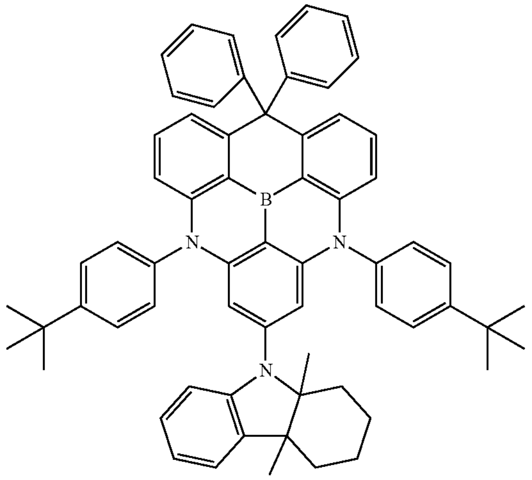
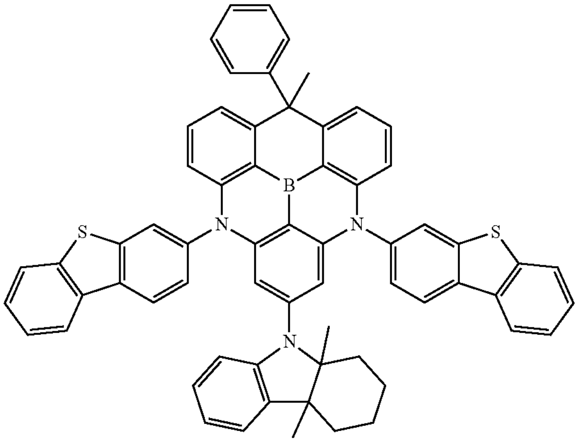
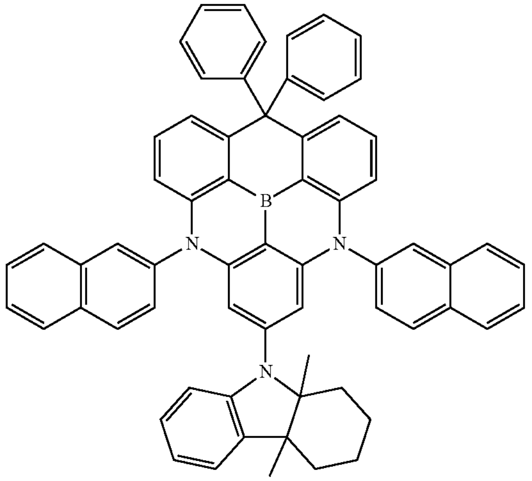
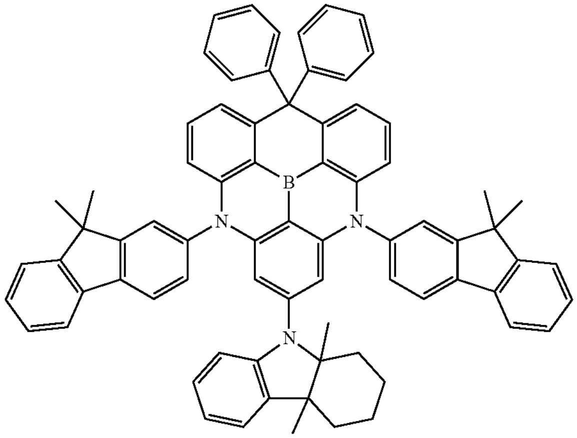
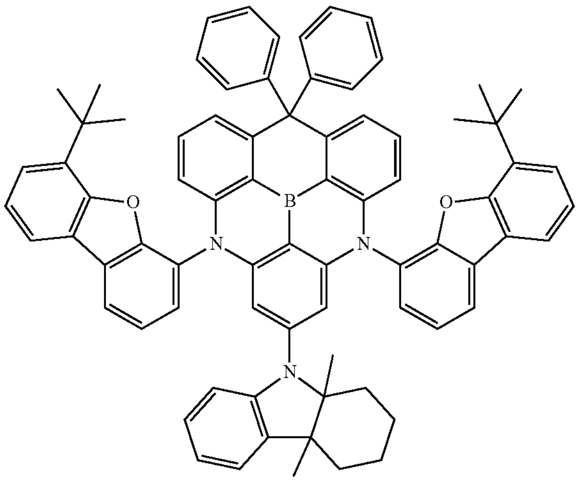
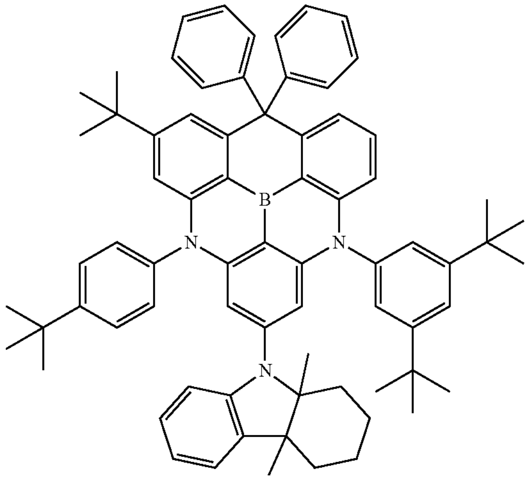

-continued
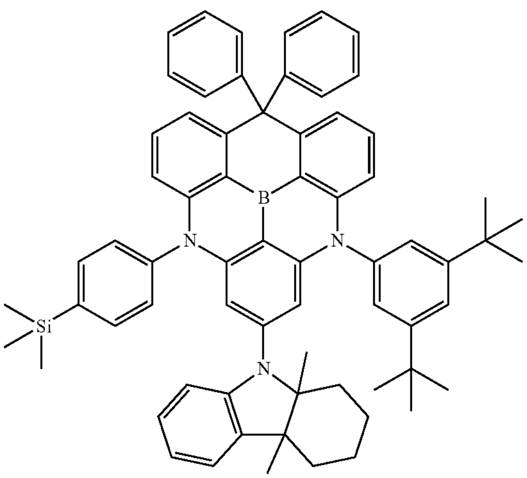
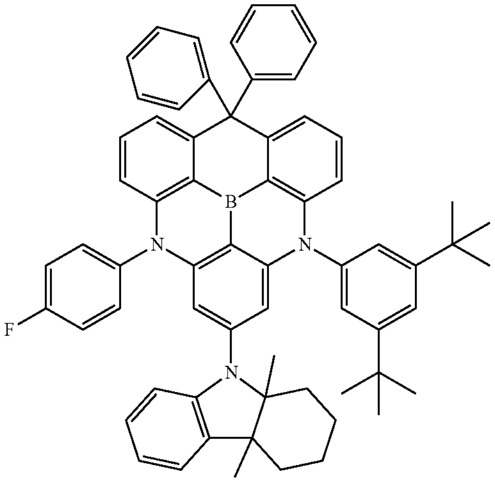
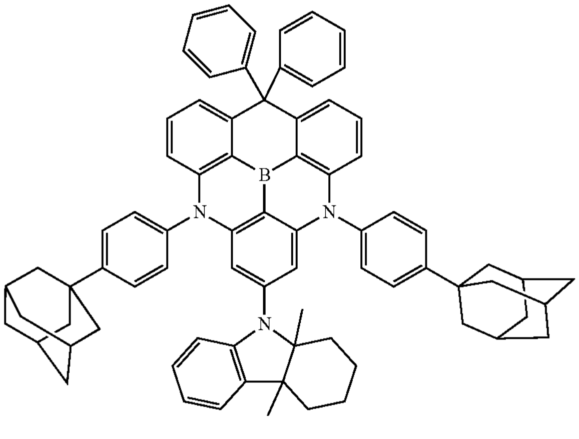
-continued
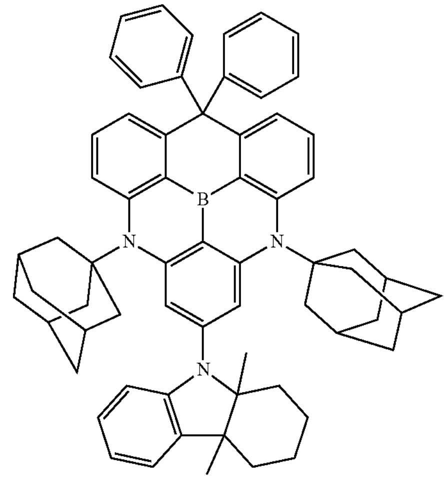
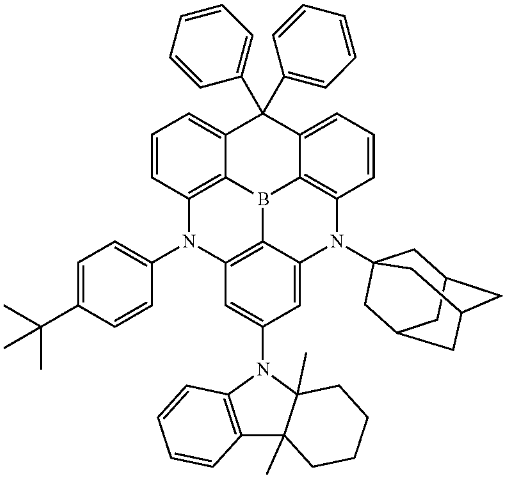
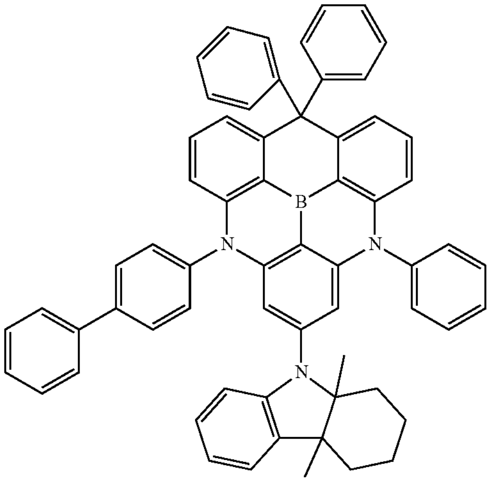

-continued
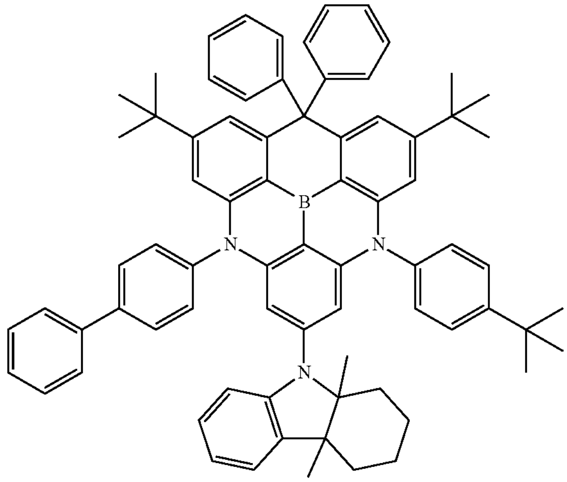
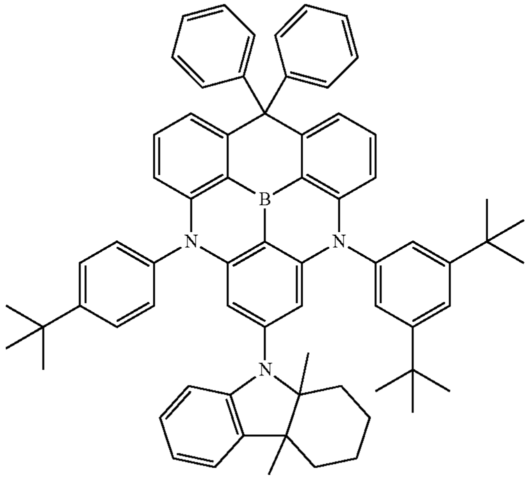
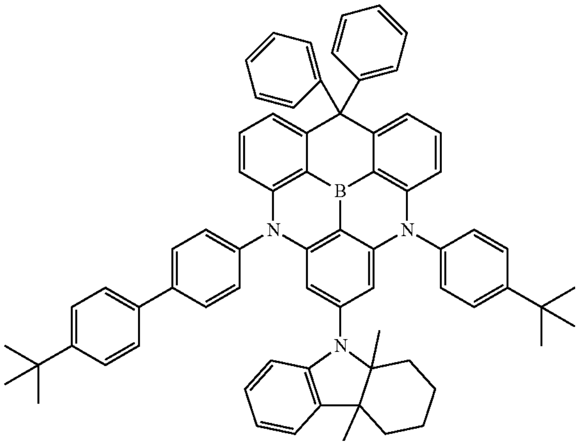
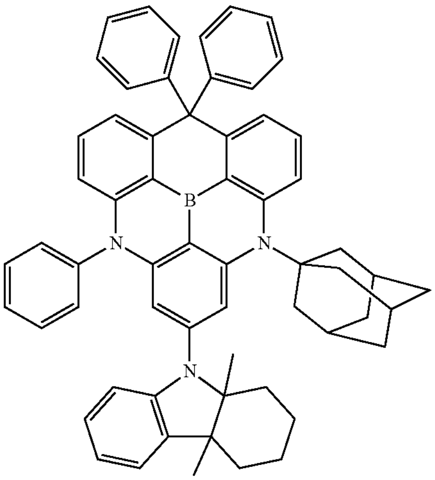
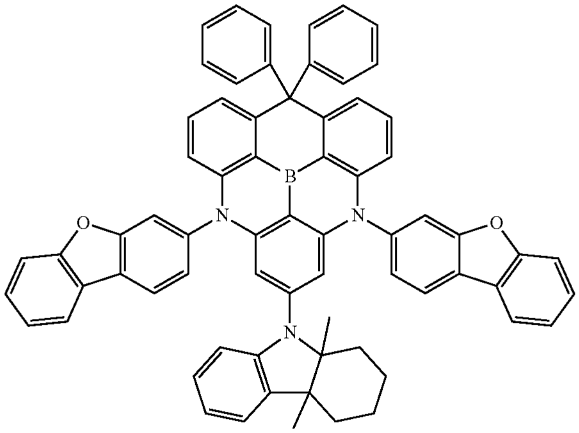
-continued
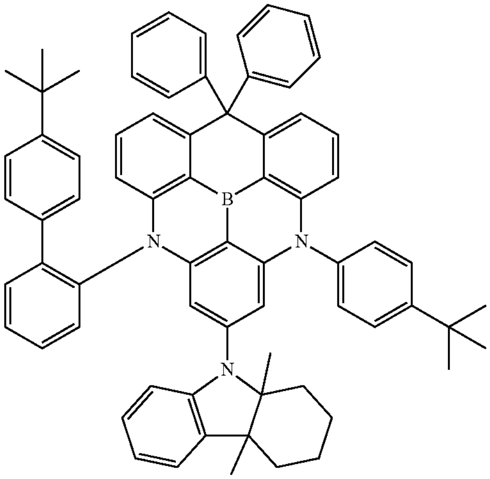

-continued
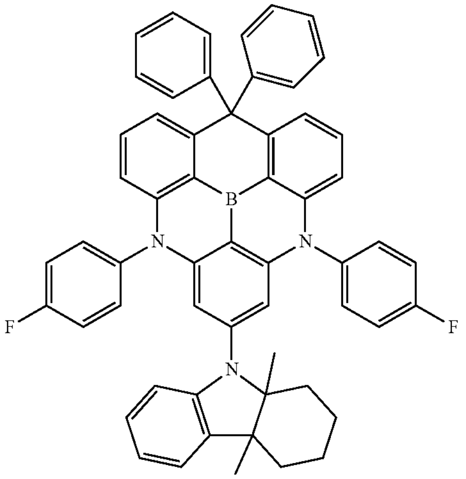
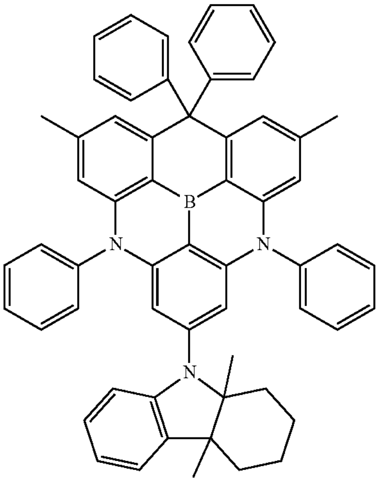
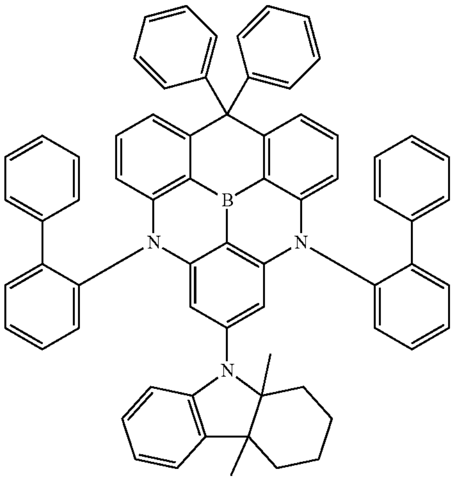
-continued
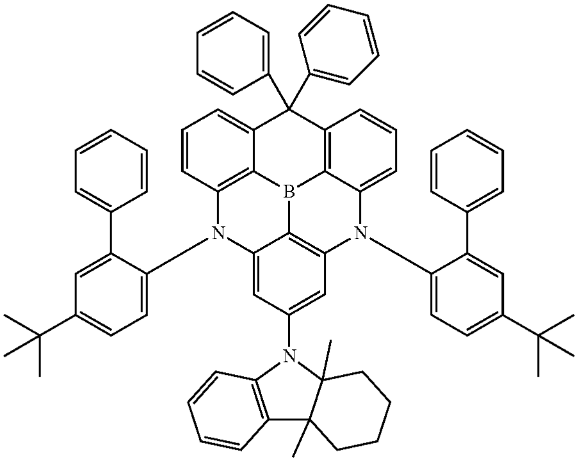
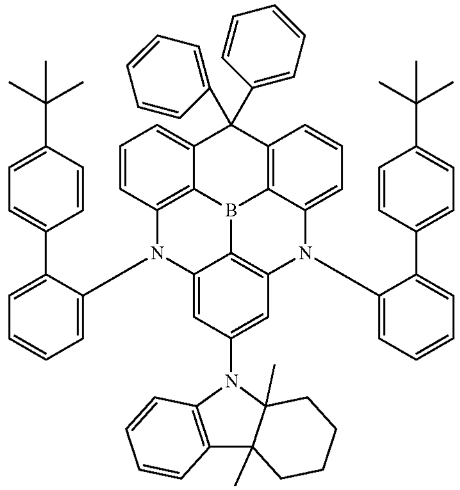
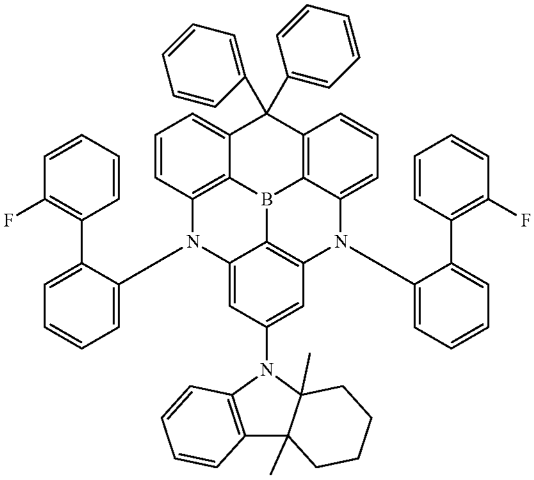

-continued
-continued
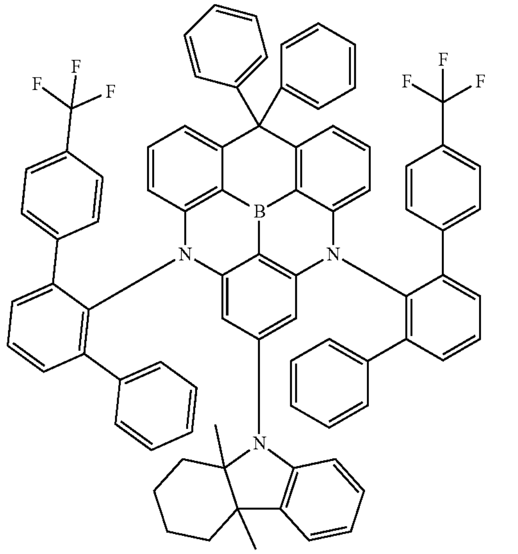
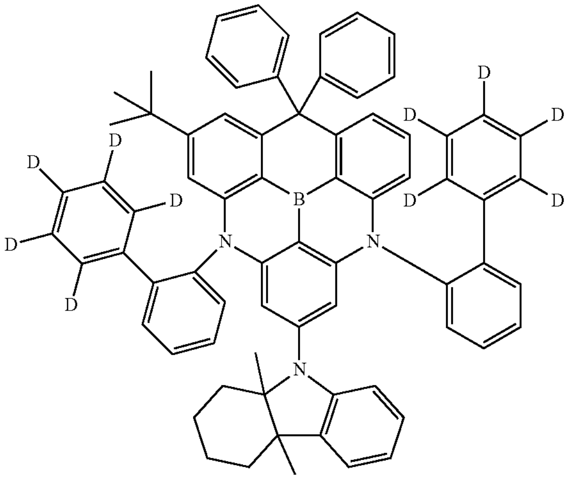
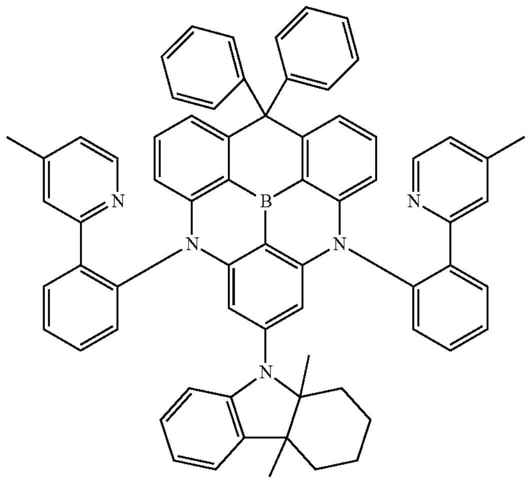
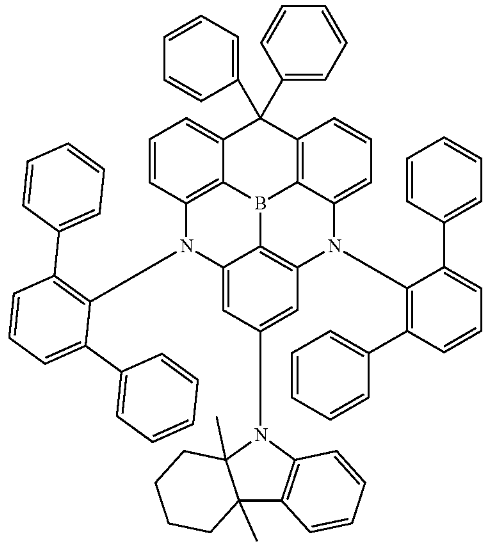
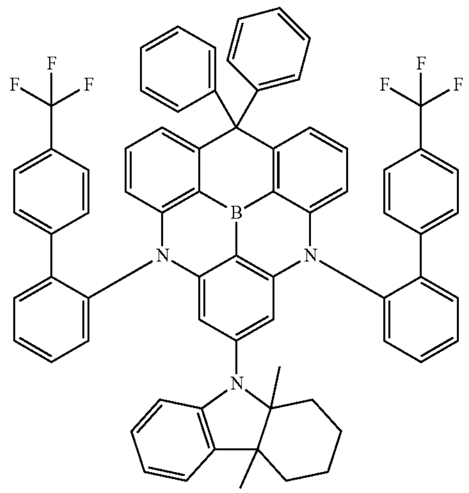
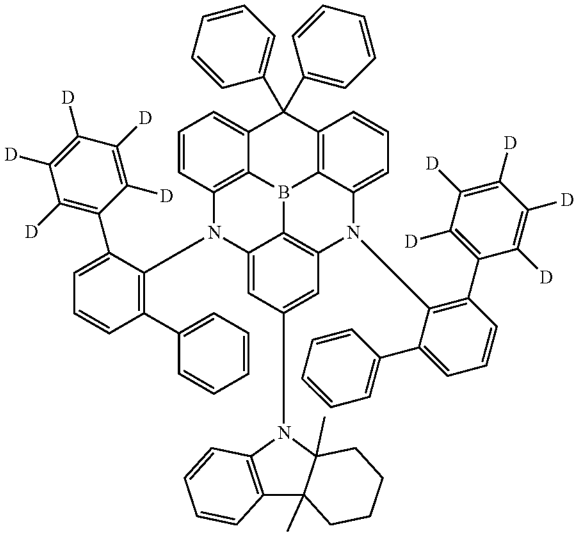

-continued
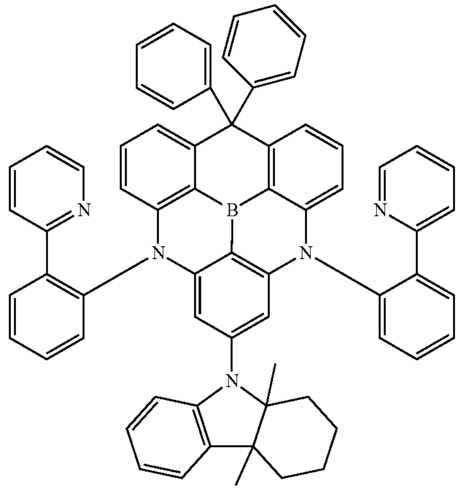 [SMILES: CC12CCCCC1(C)N(c1cc3c4c(c1)N(c1ccccc1-c1ccccn1)c1cccc5c1B4c1c(cccc1C5(c1ccccc1)c1ccccc1)N3c1ccccc1-c1ccccn1)c1ccccc12]
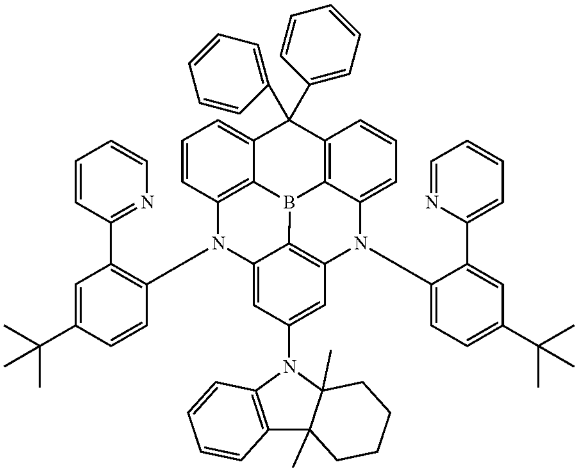
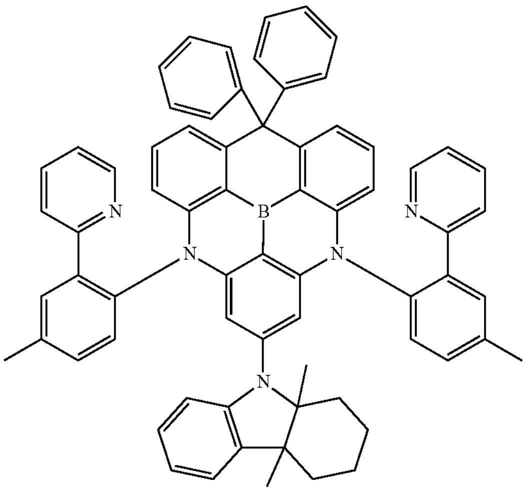
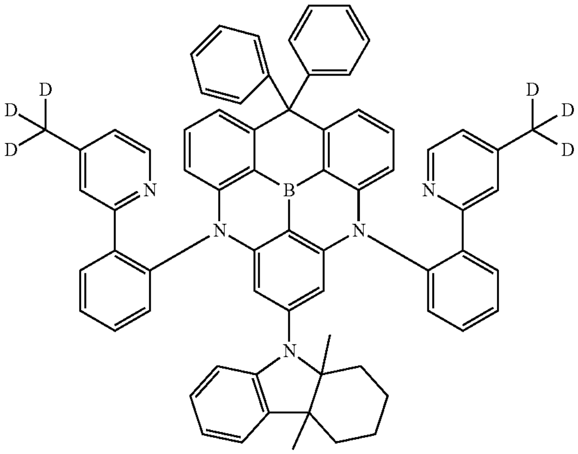 [SMILES: [2H]C([2H])([2H])c1ccnc(-c2ccccc2N2c3cc(N4c5ccccc5C5(C)CCCCC45C)cc4c3B3c5c2cccc5C(c2ccccc2)(c2ccccc2)c2cccc(c23)N4c2ccccc2-c2cc(C([2H])([2H])[2H])ccn2)c1]
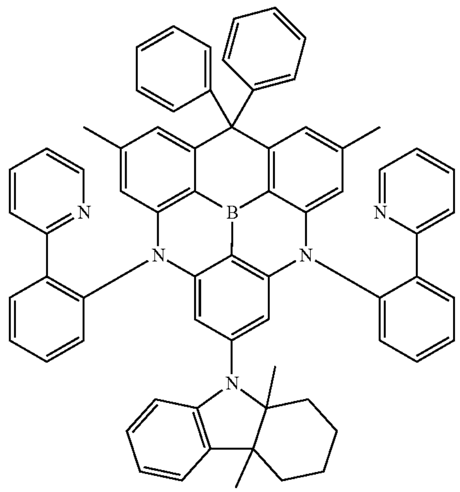
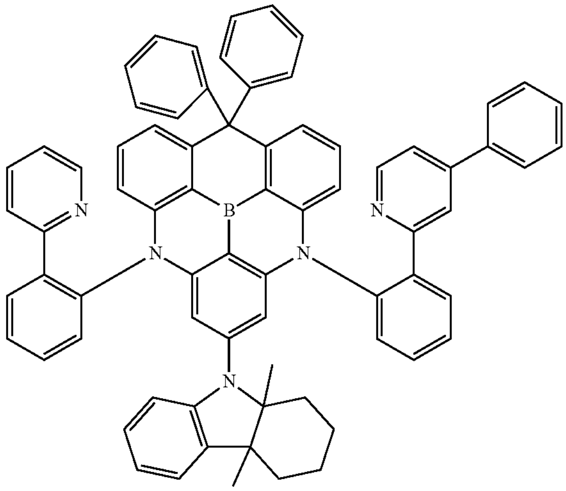

-continued
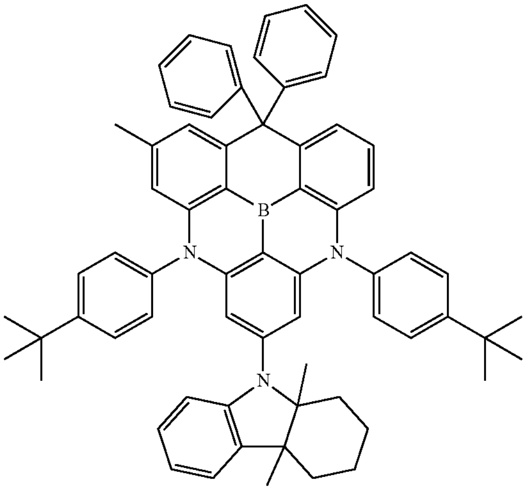
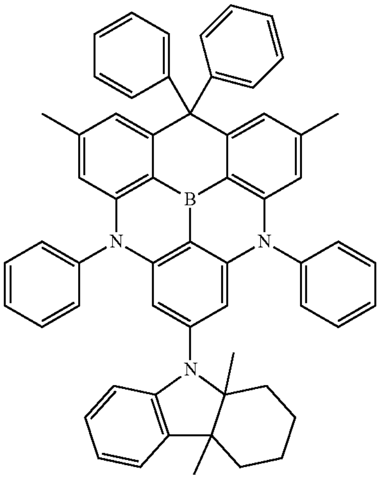
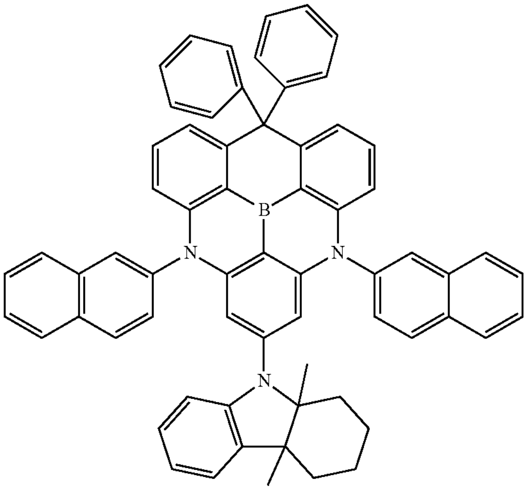
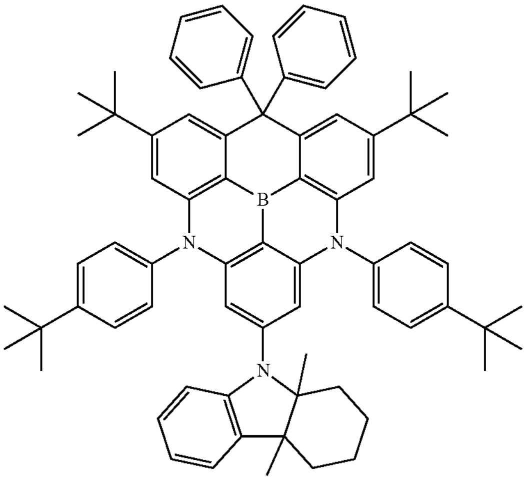
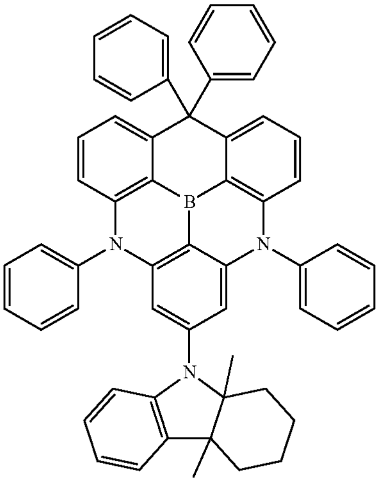
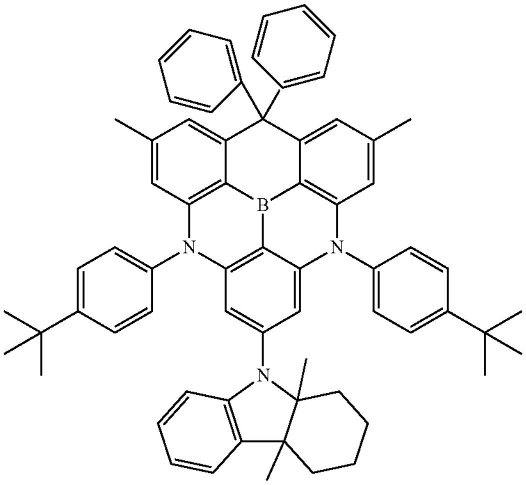
-continued -continued
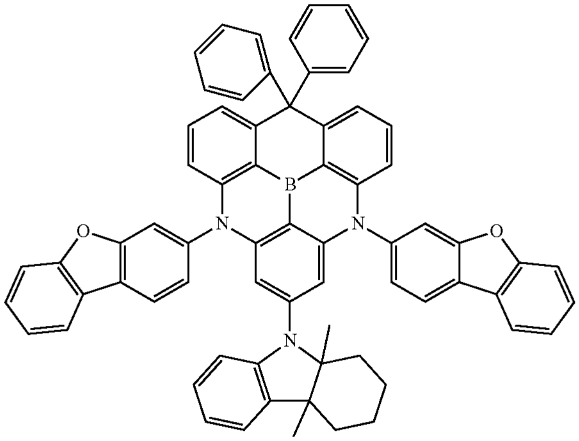
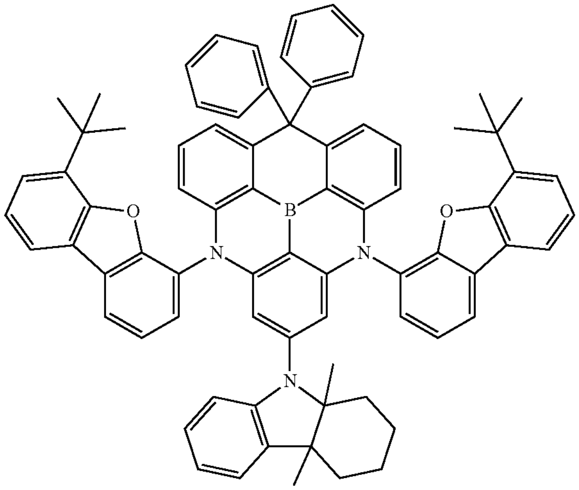
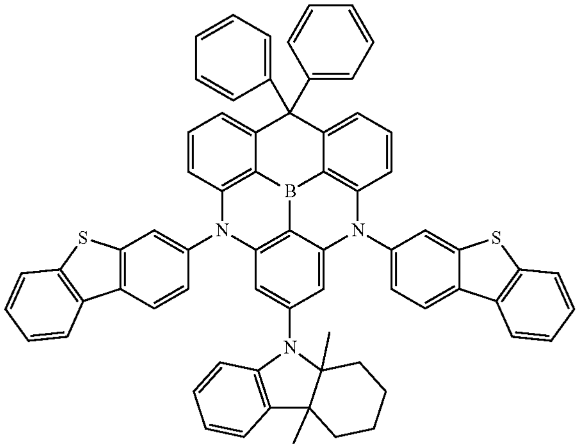
-continued
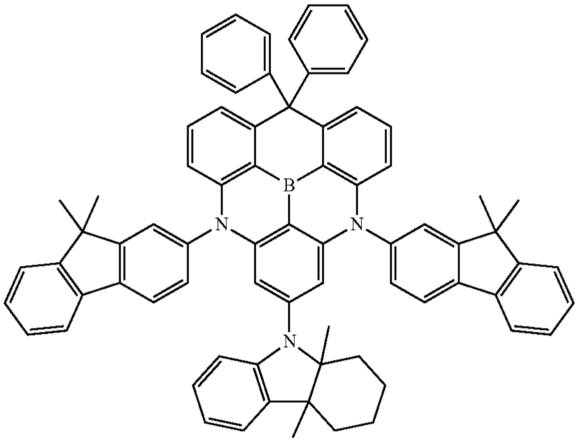
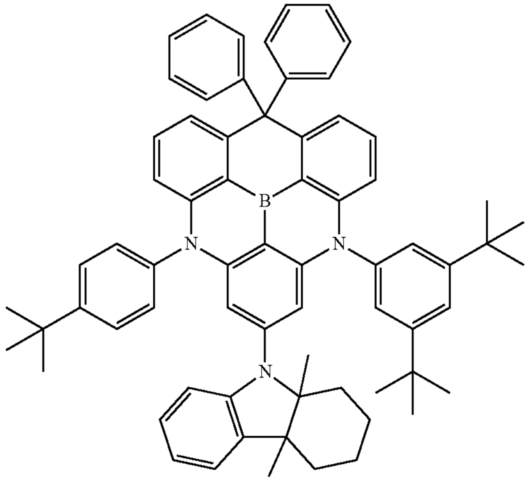
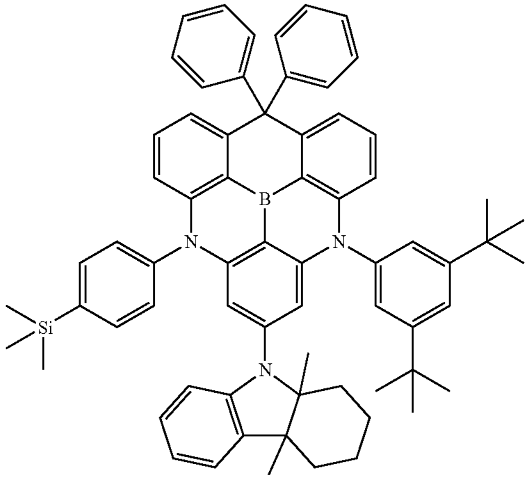

-continued
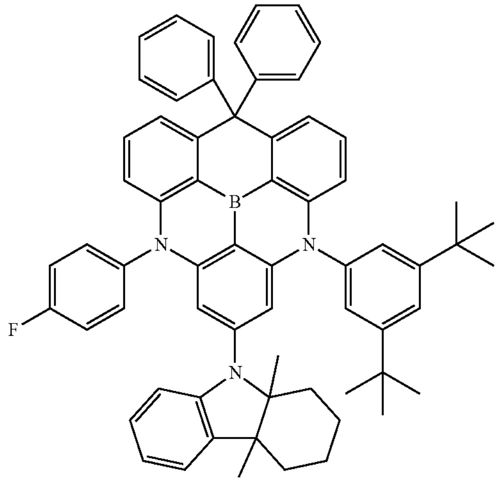
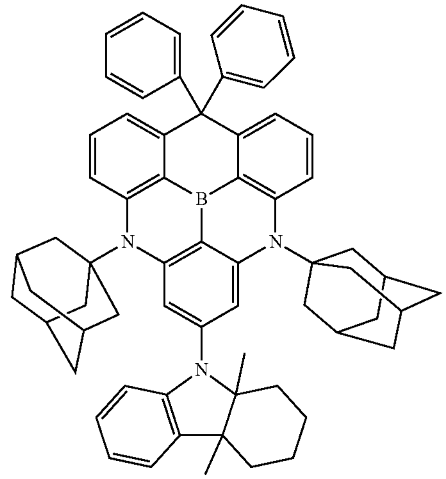
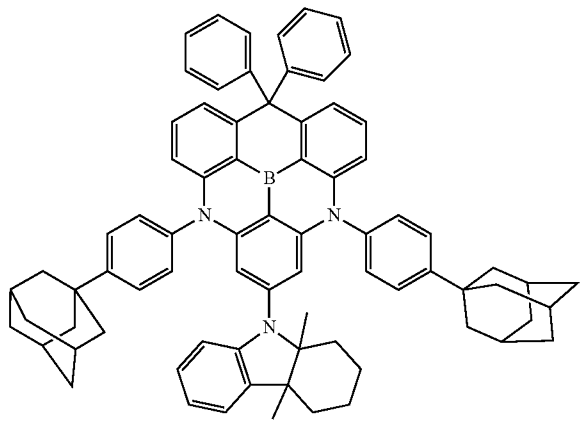
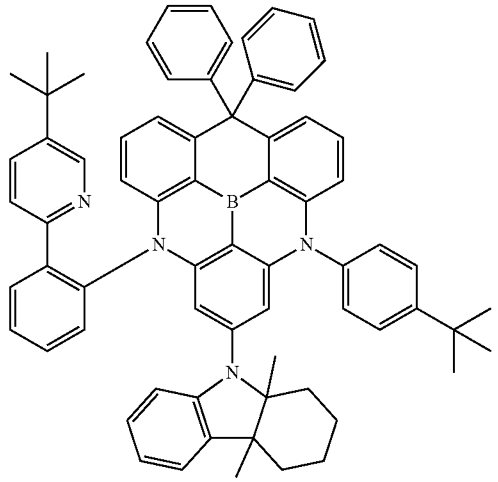
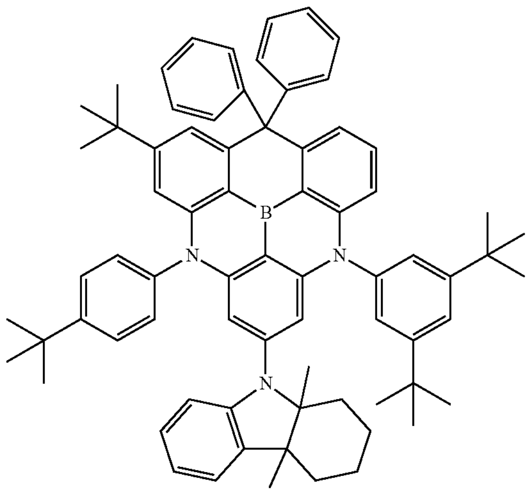
-continued
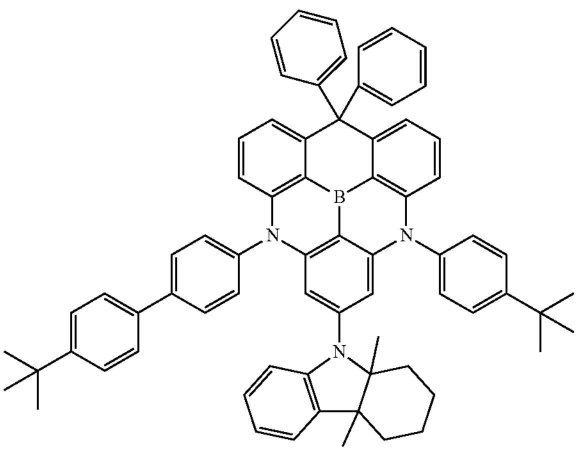

-continued
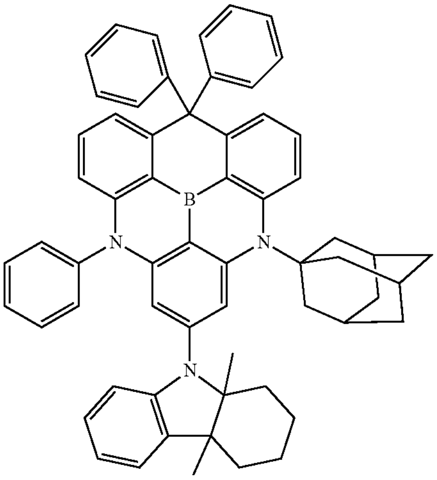
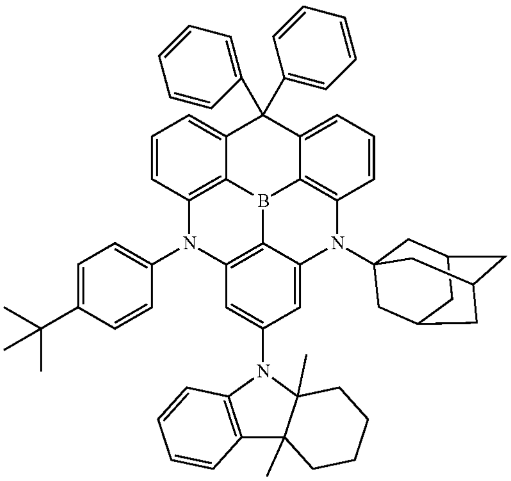
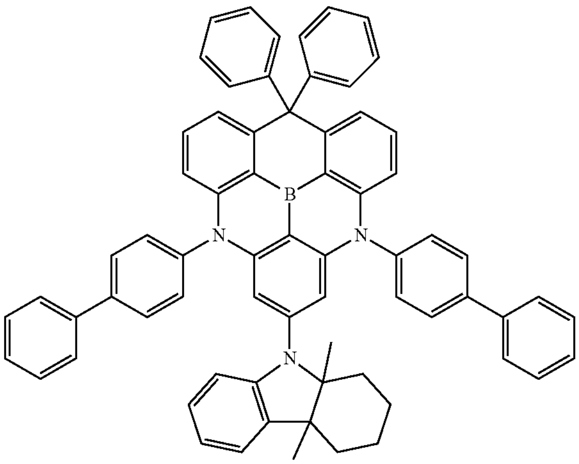
-continued
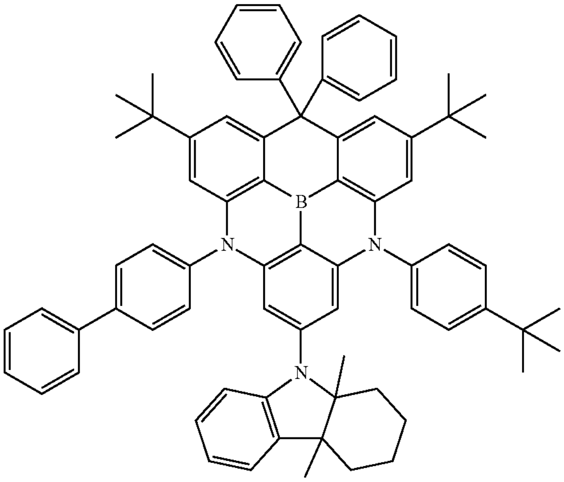
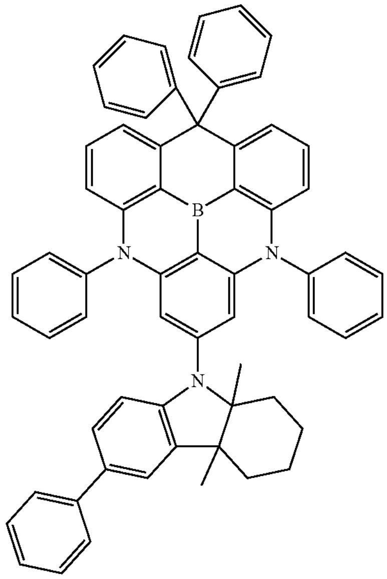
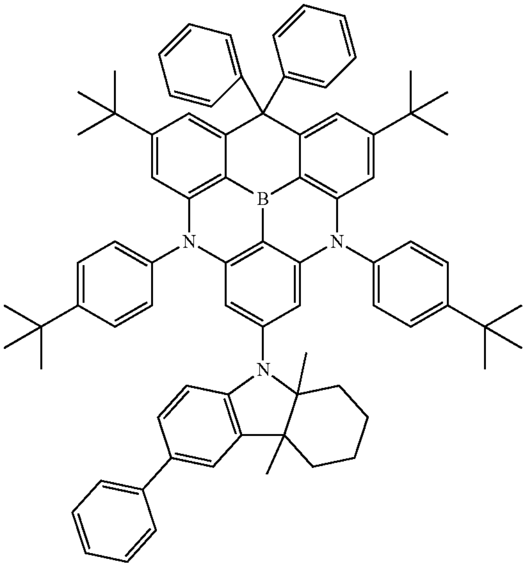

-continued
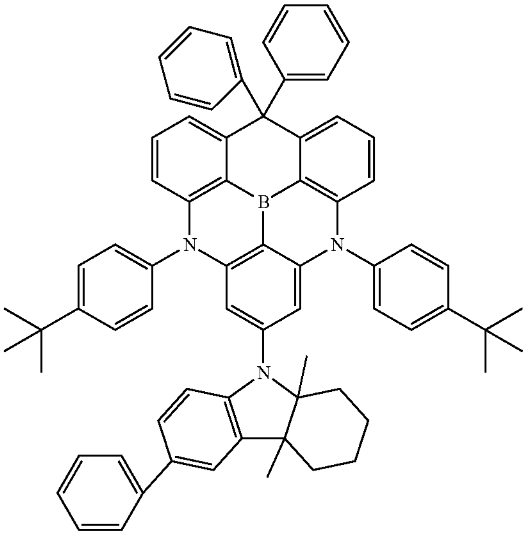
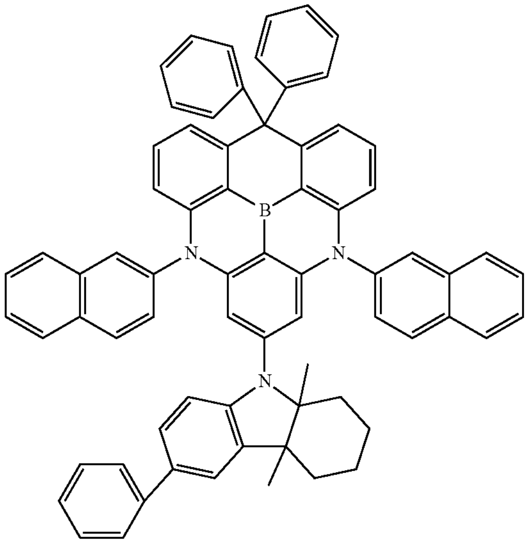
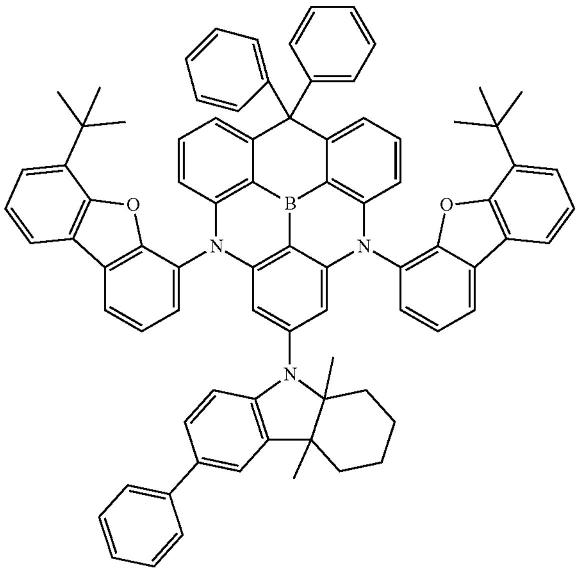
-continued
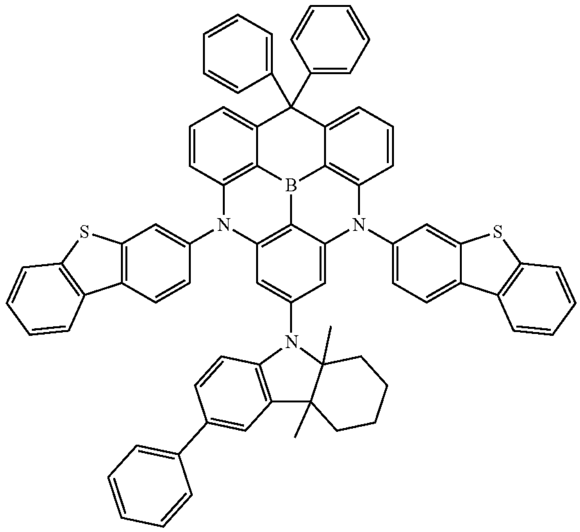
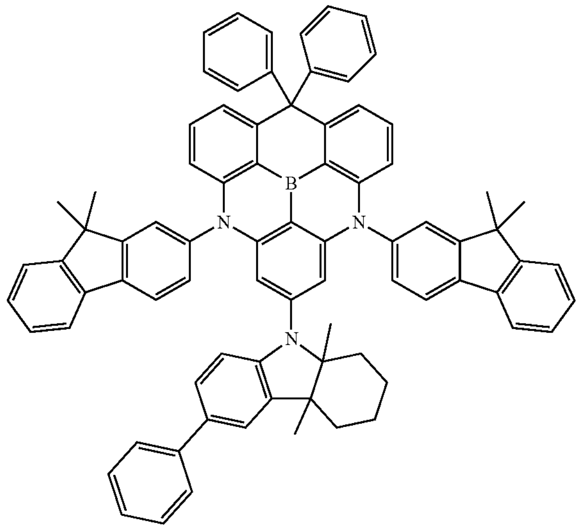
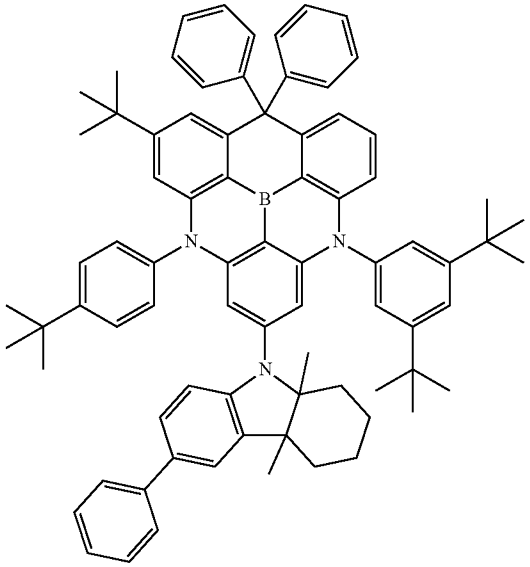

-continued
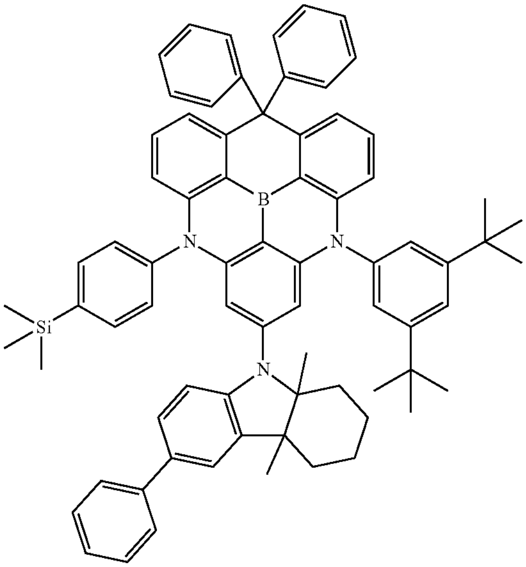
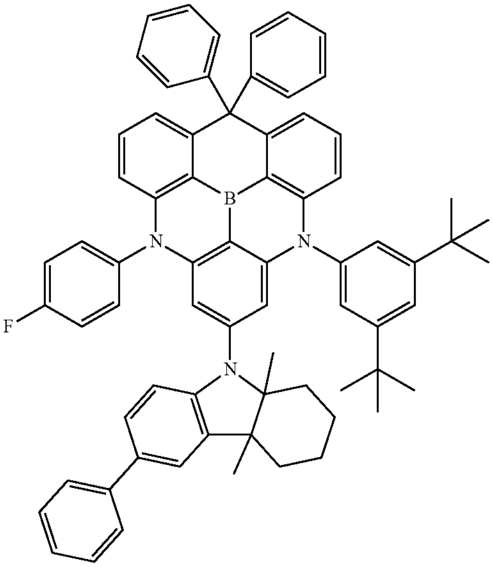
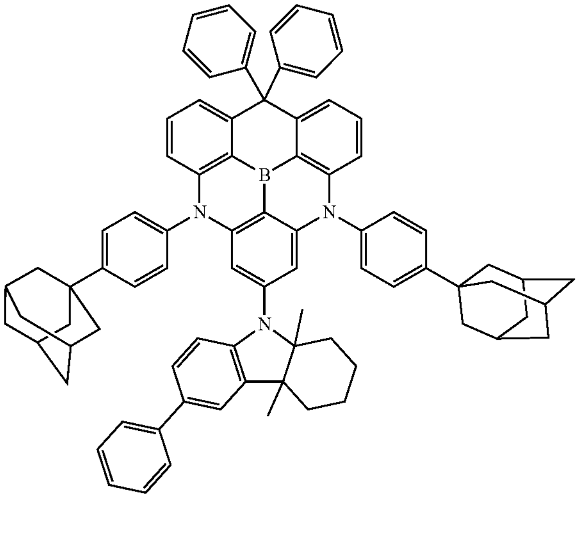
-continued
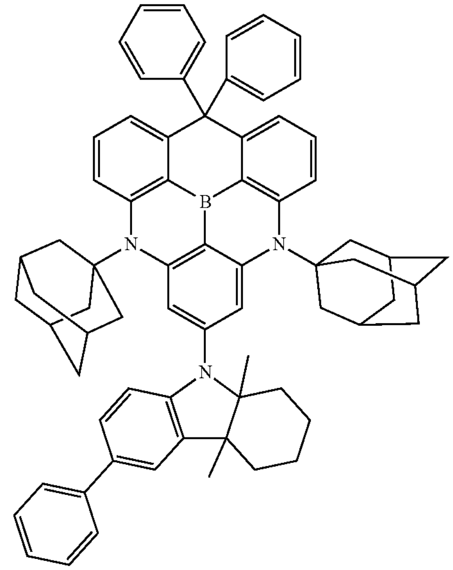
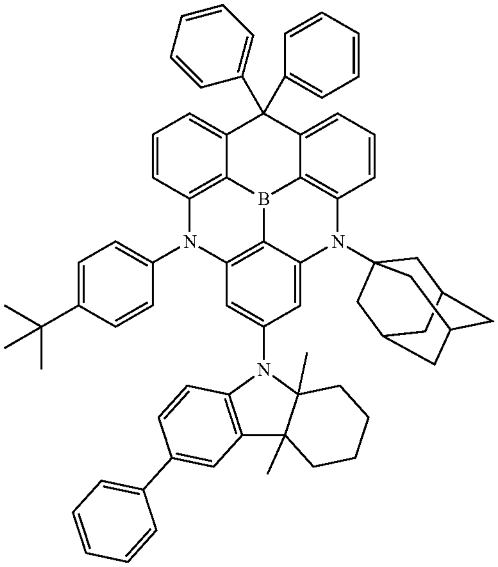
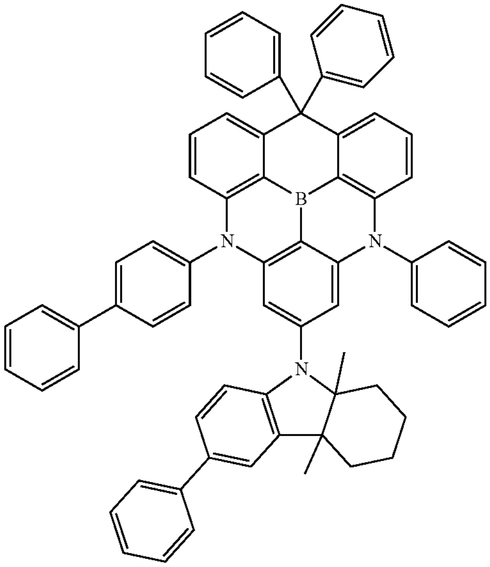 [SMILES: CC12CCCCC1(C)N(c1cc3c4c(c1)N(c1ccc(-c5ccccc5)cc1)c1cccc5c1B4c1c(cccc1C5(c1ccccc1)c1ccccc1)N3c1ccccc1)c1ccc(-c3ccccc3)cc12]

-continued
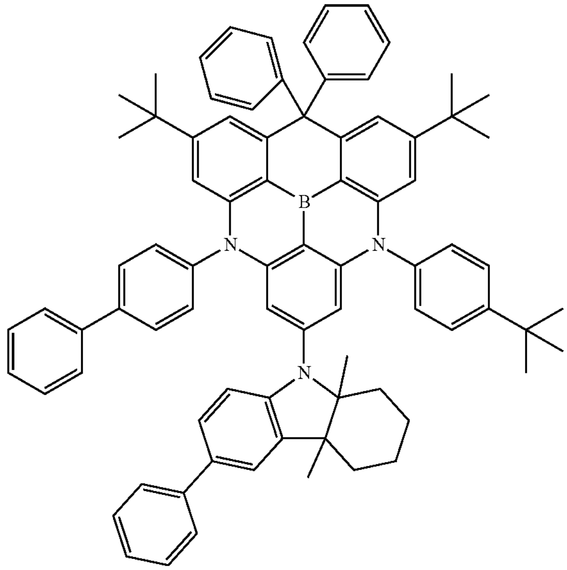
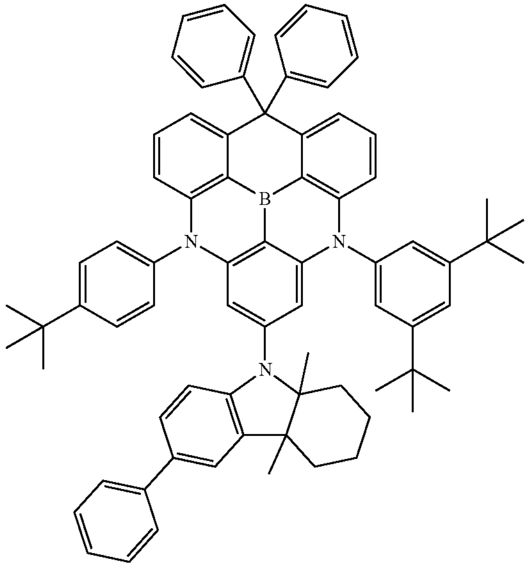
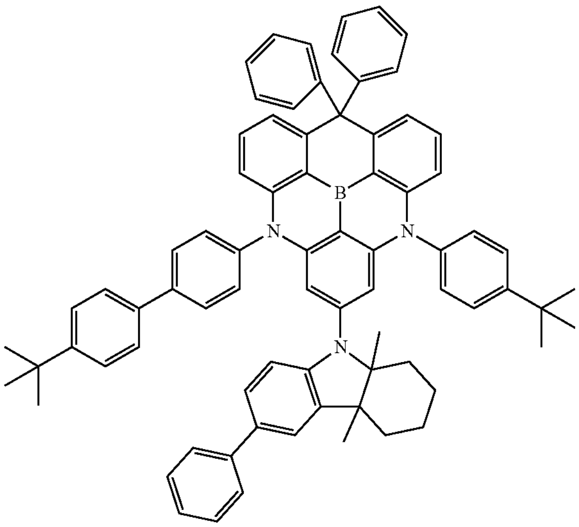
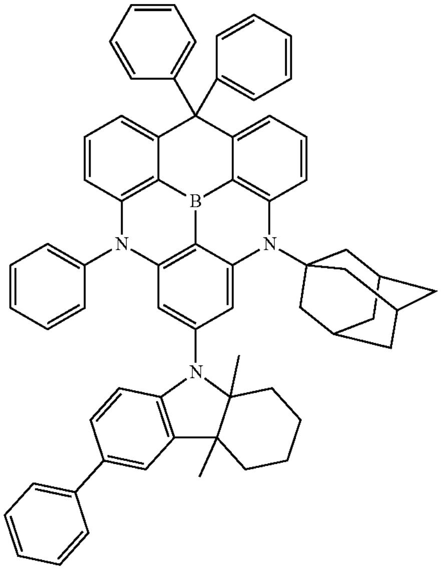
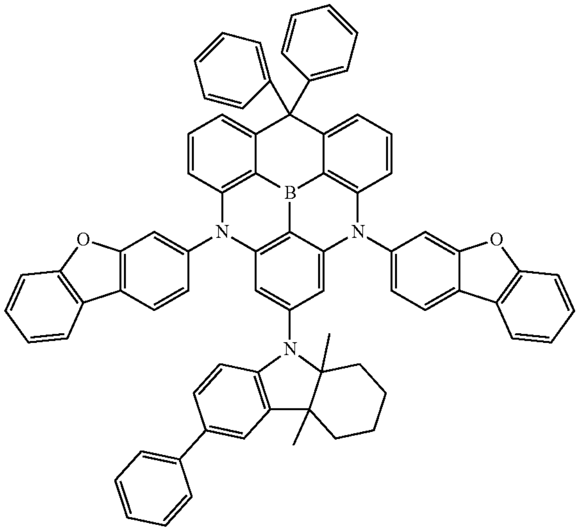
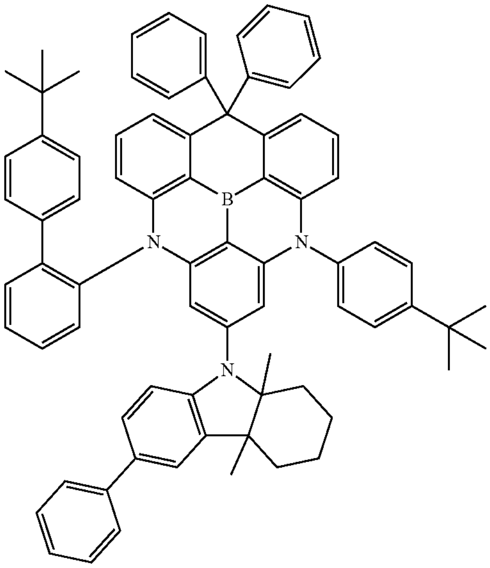
-continued -continued
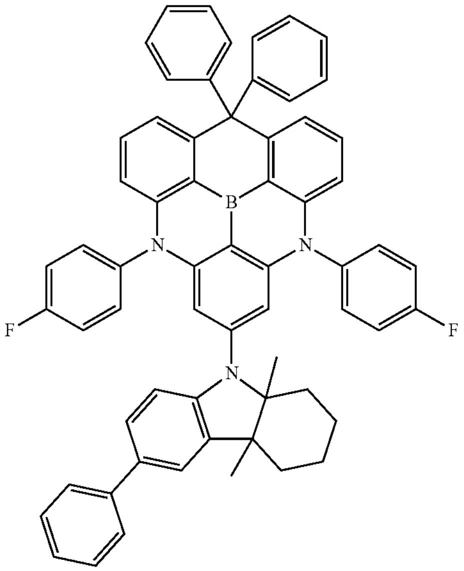
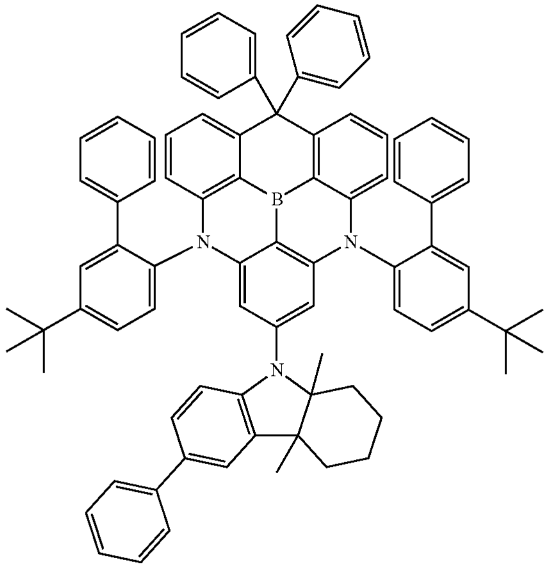
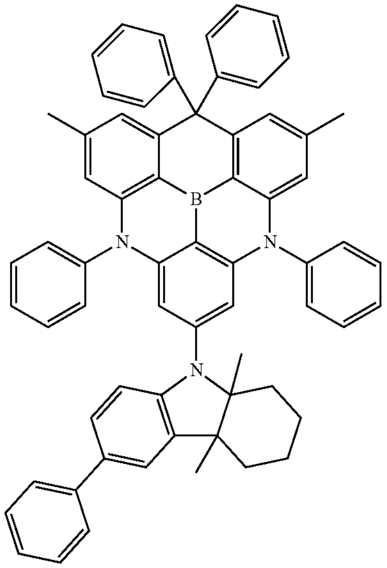
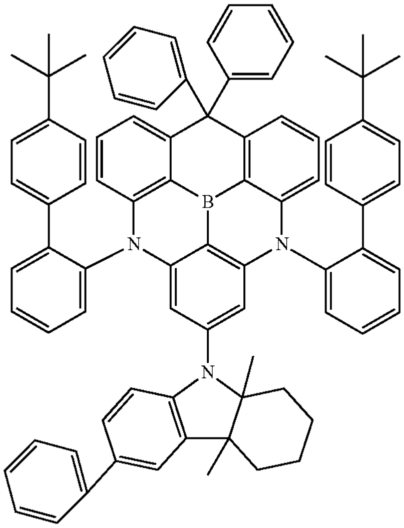
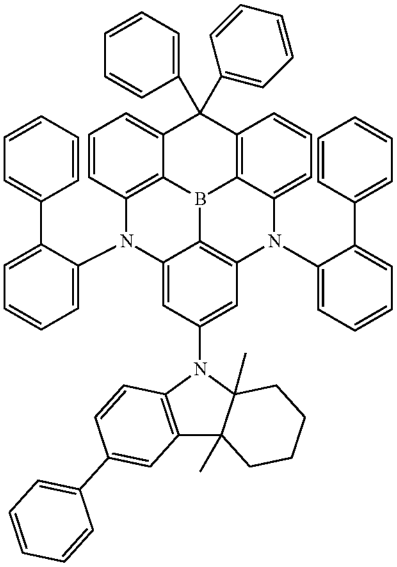
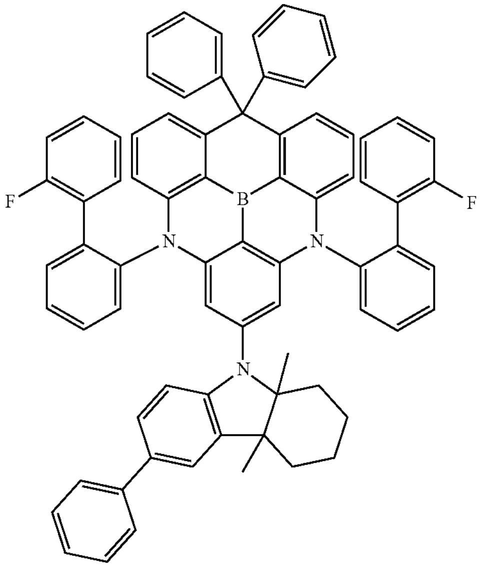

-continued
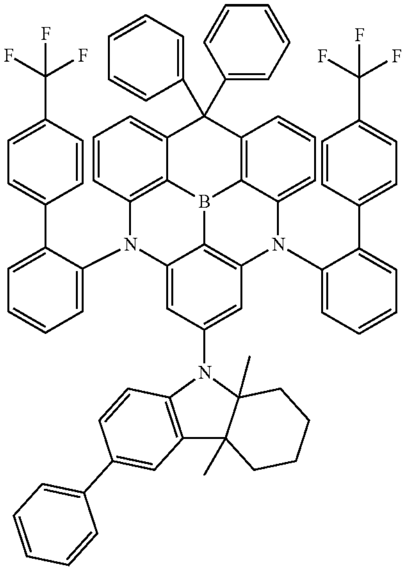
-continued
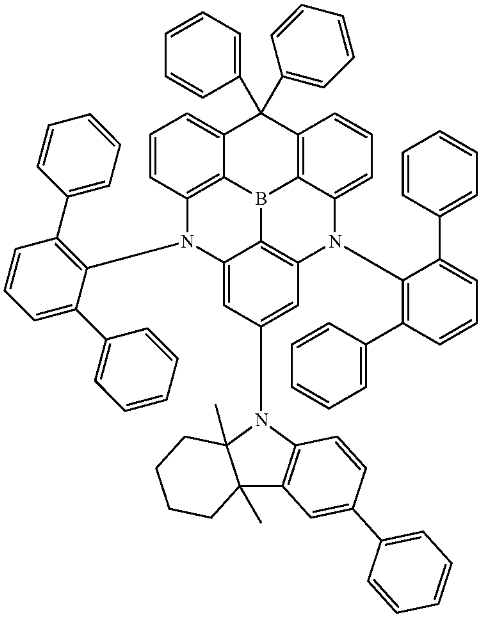
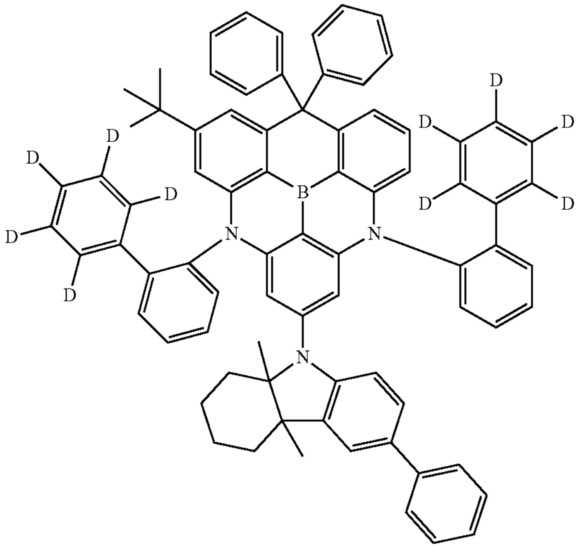
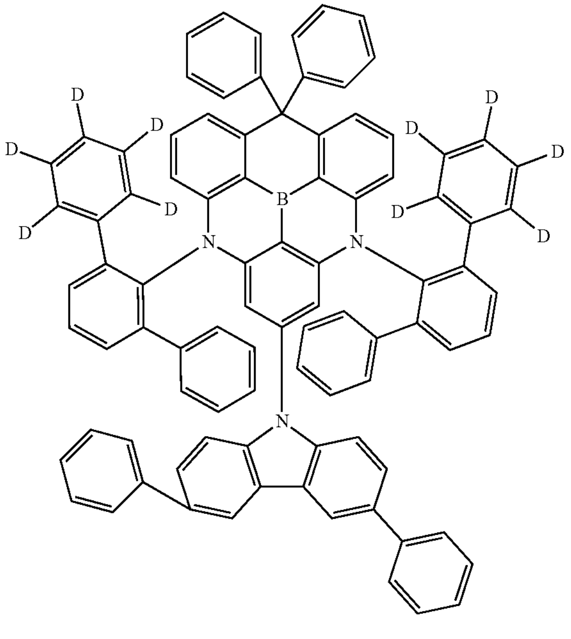

-continued
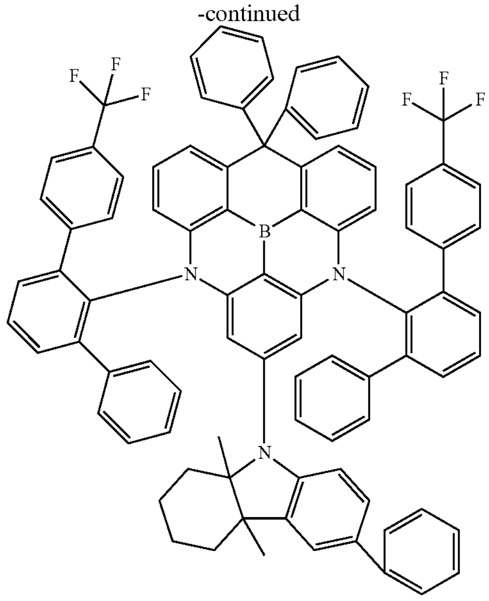
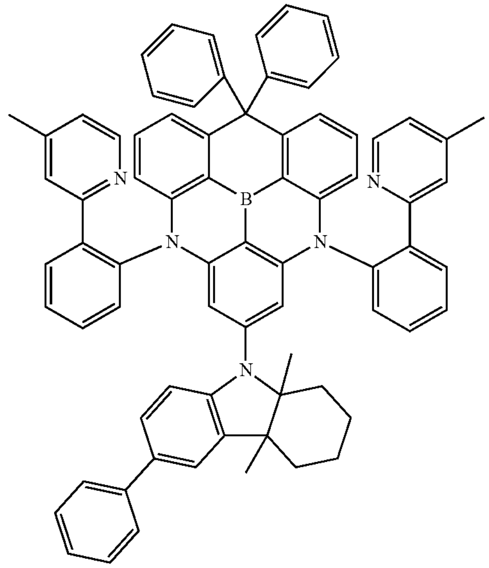
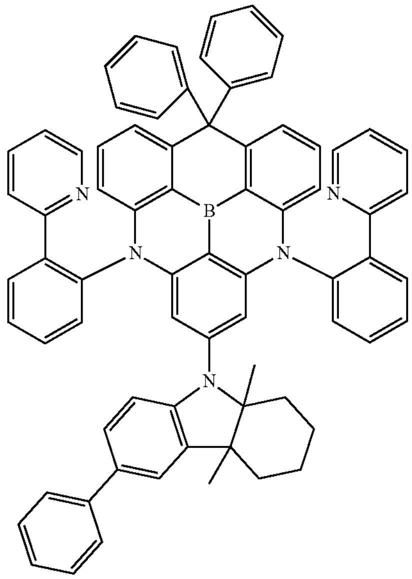
-continued
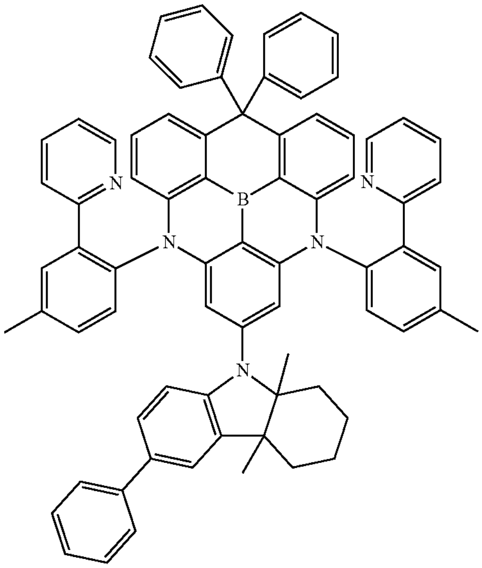
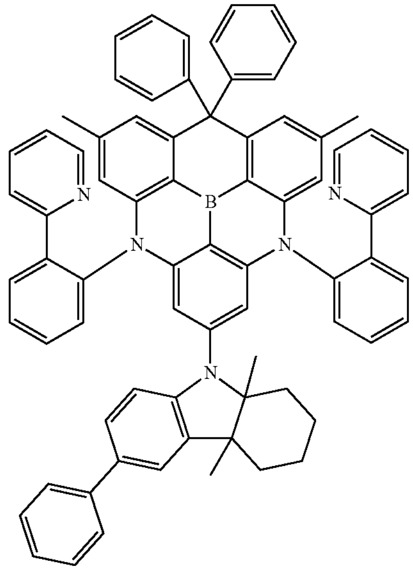
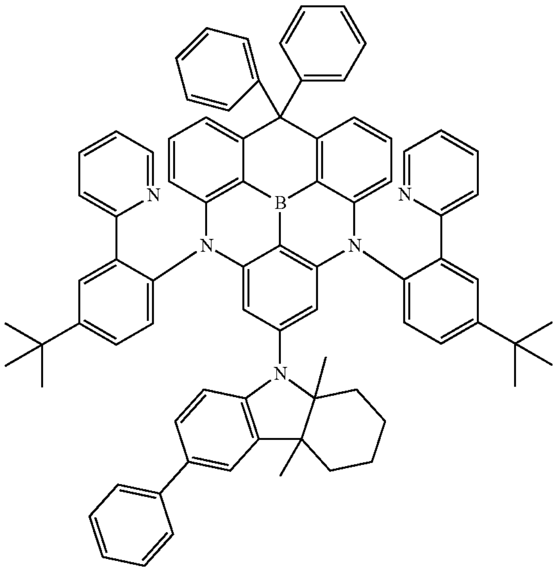

-continued
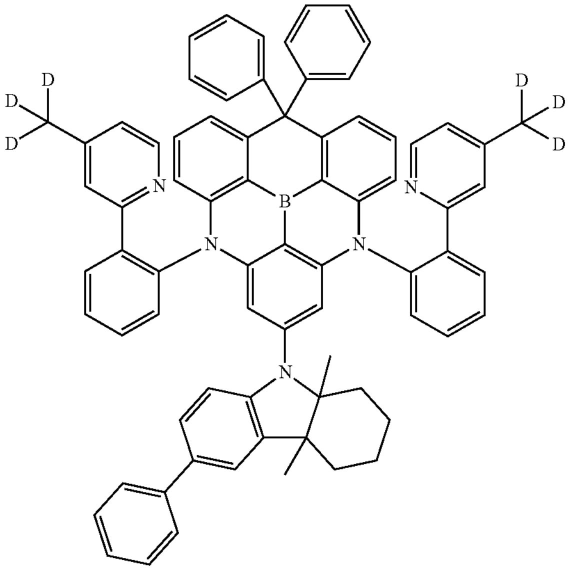
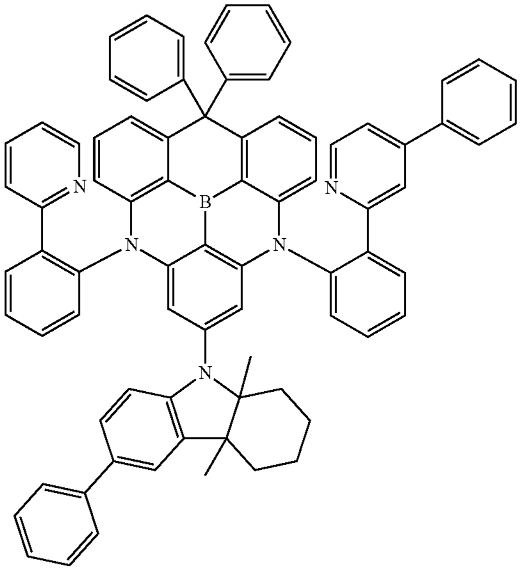
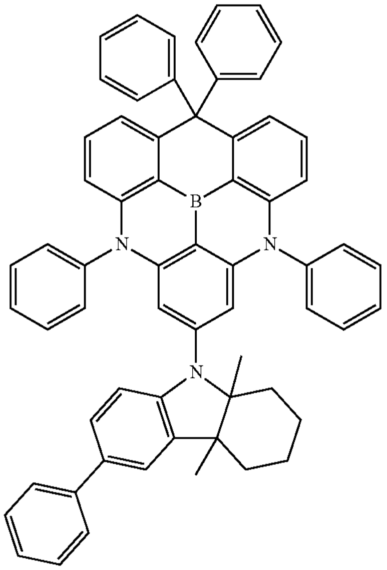
-continued
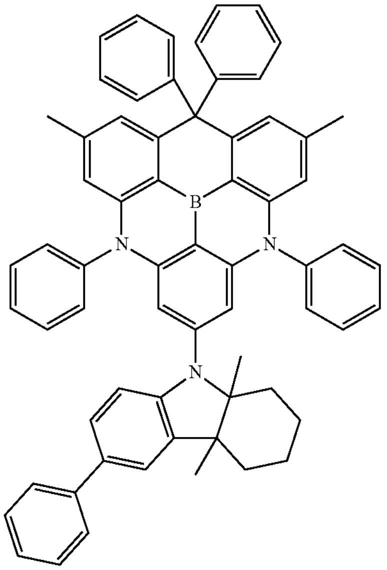
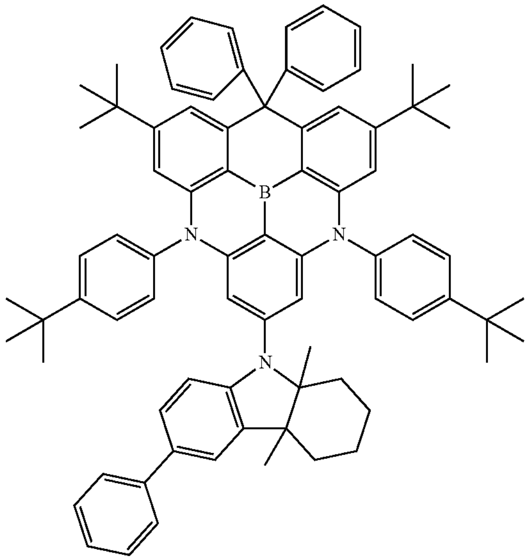
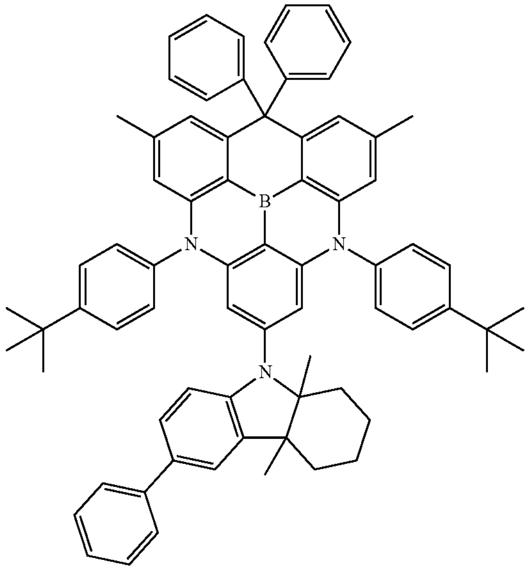

-continued
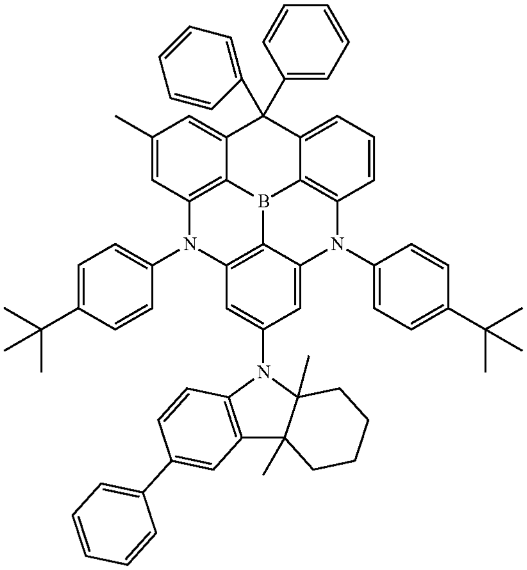
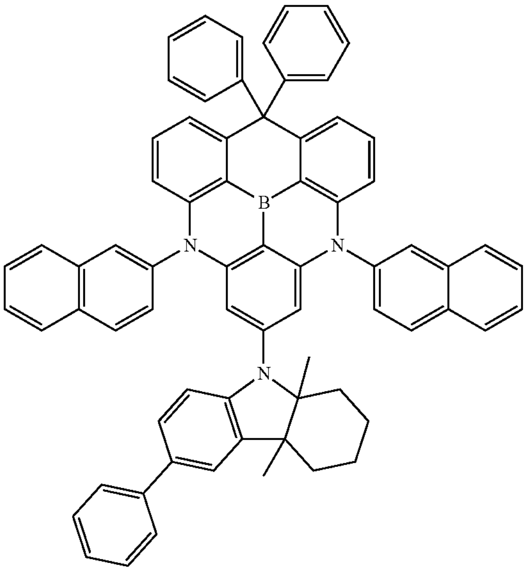
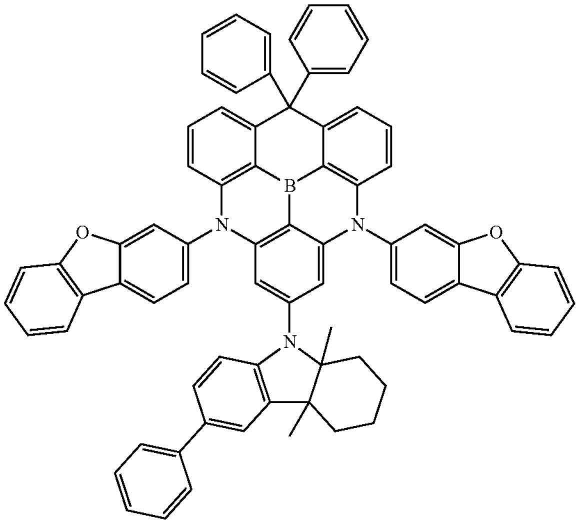
-continued
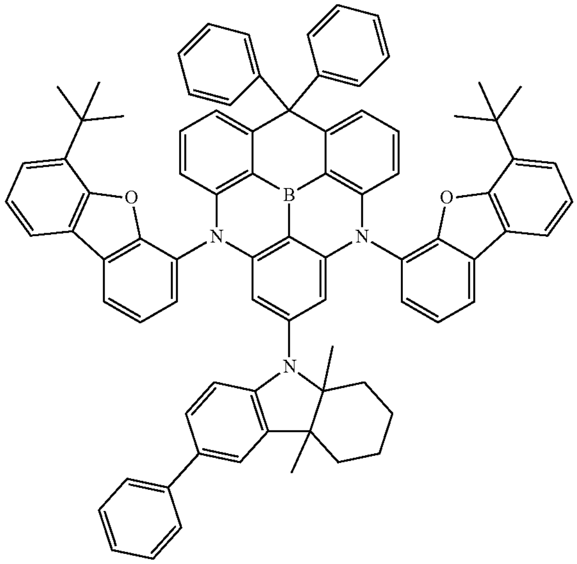
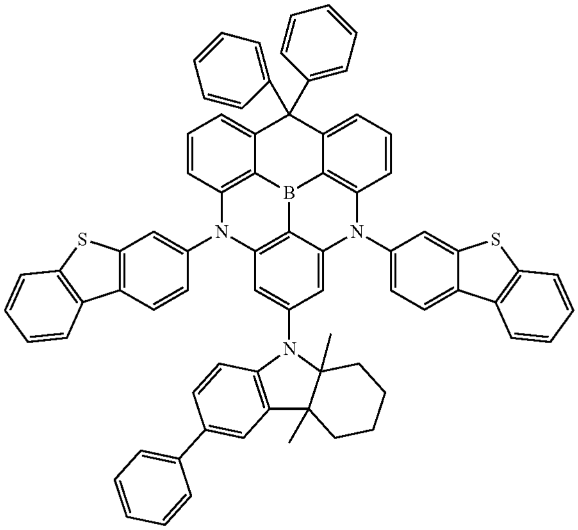
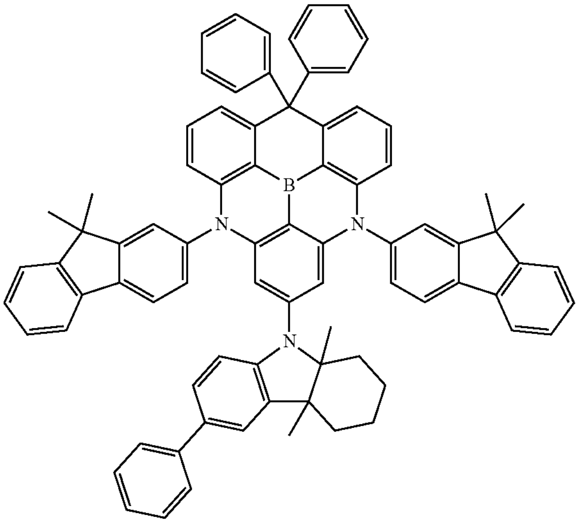

-continued
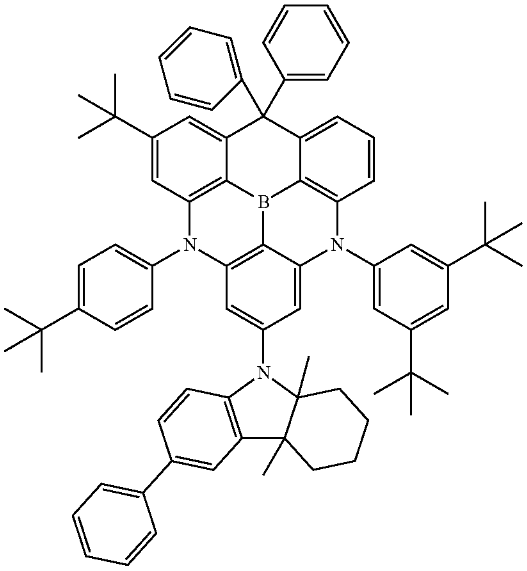
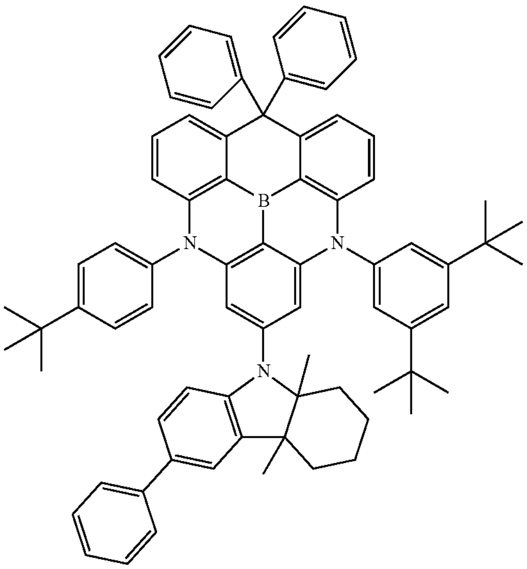
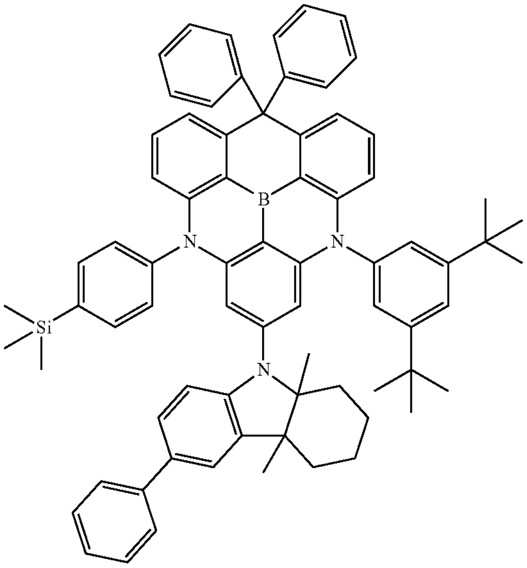
-continued
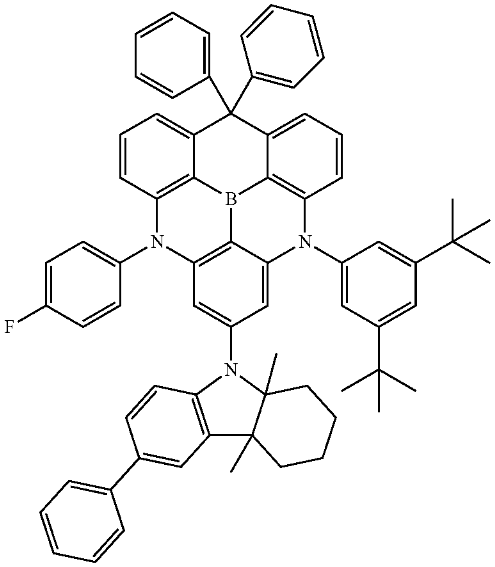
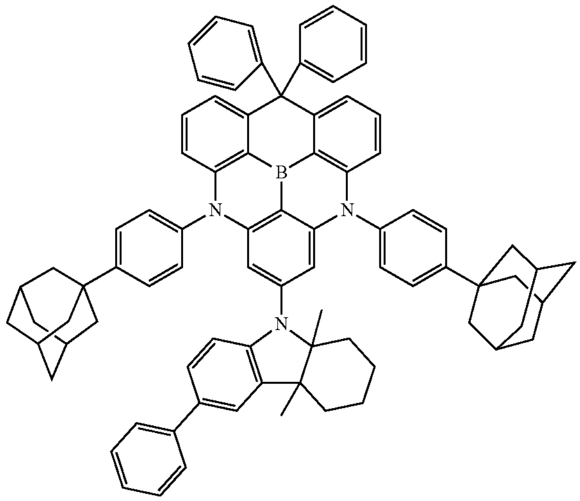
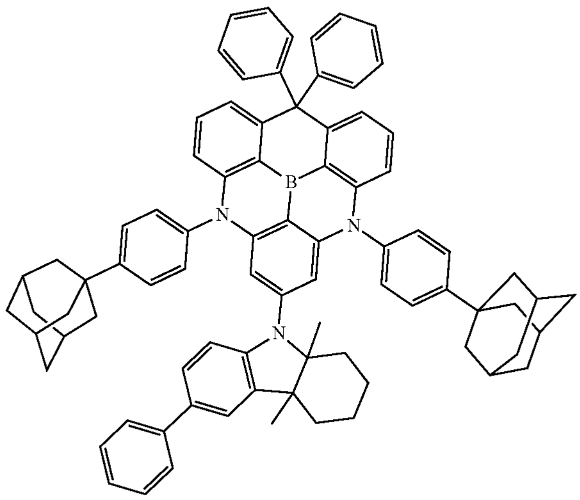

-continued
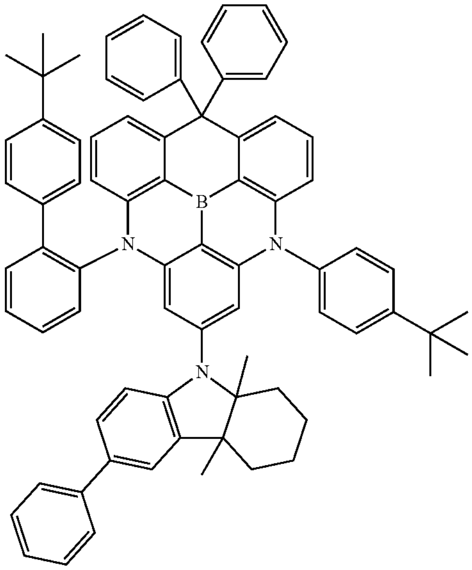
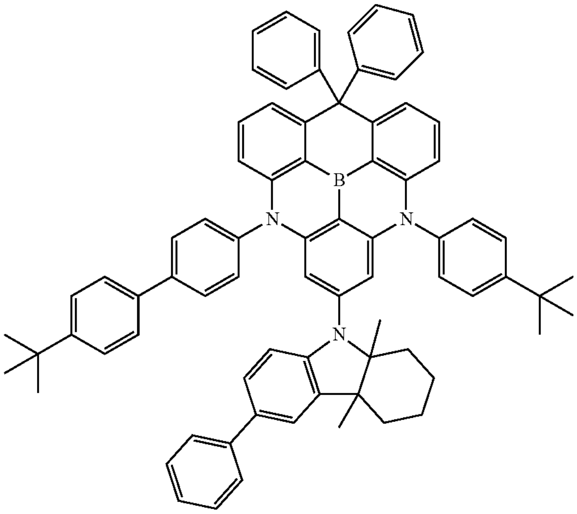
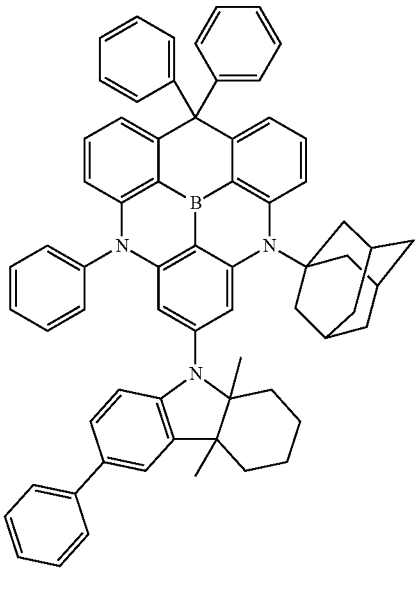
-continued
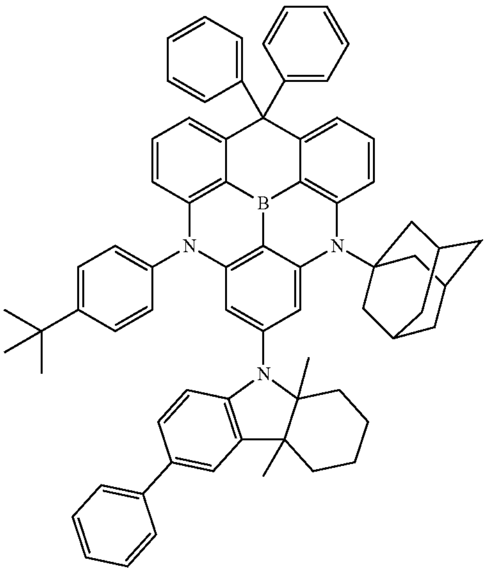
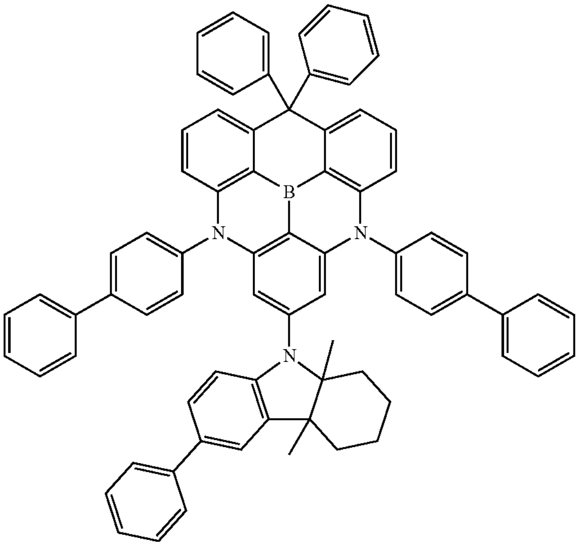
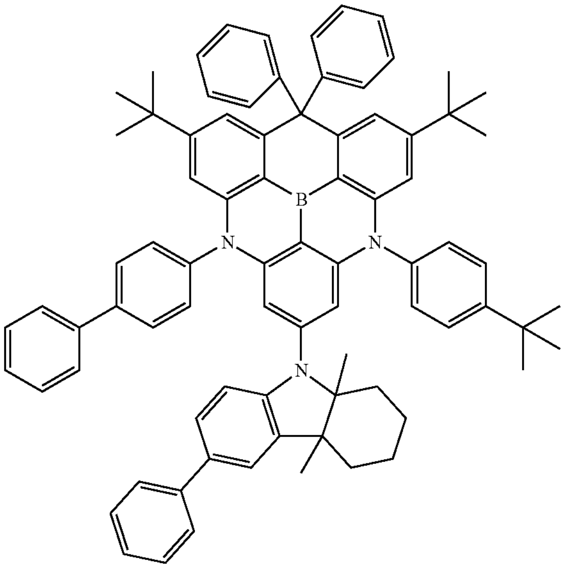

-continued
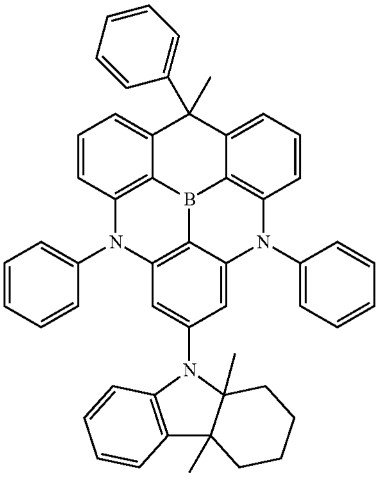
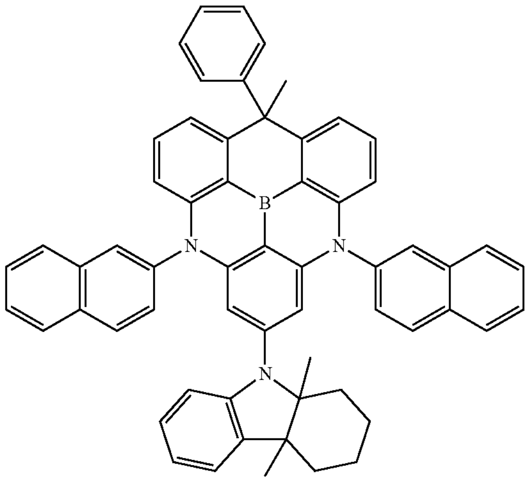
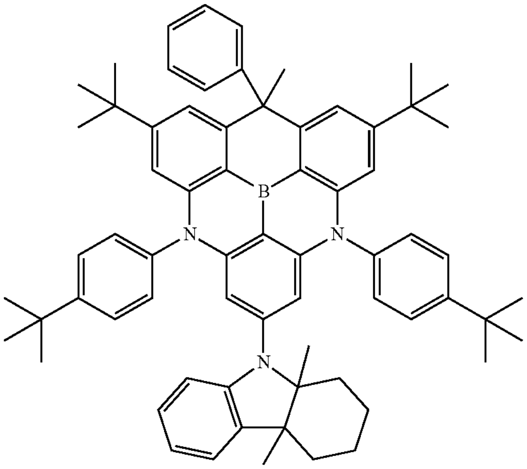
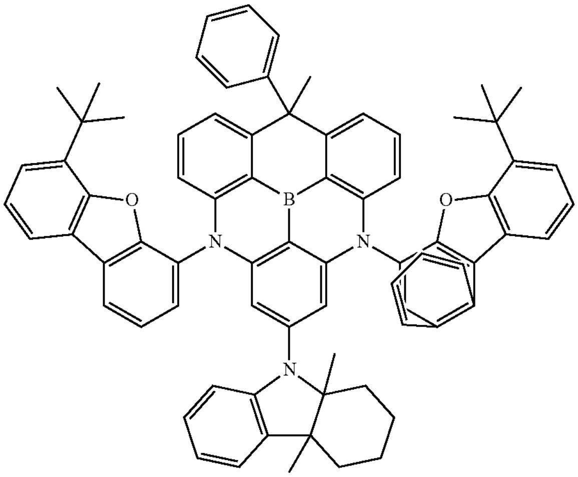
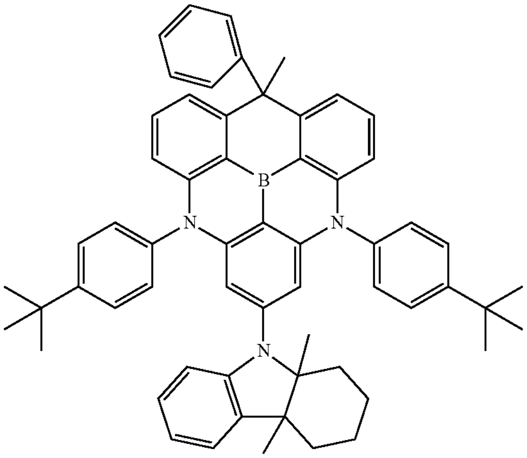
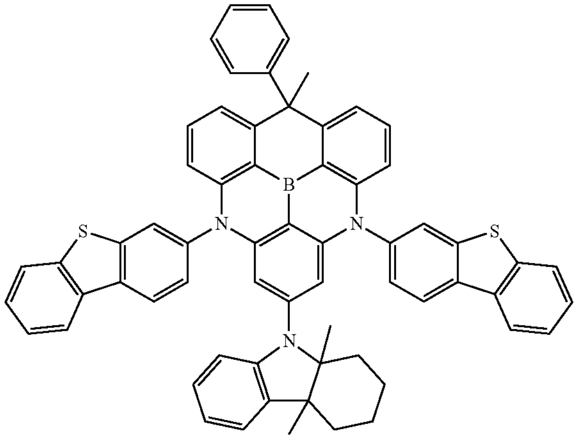

-continued
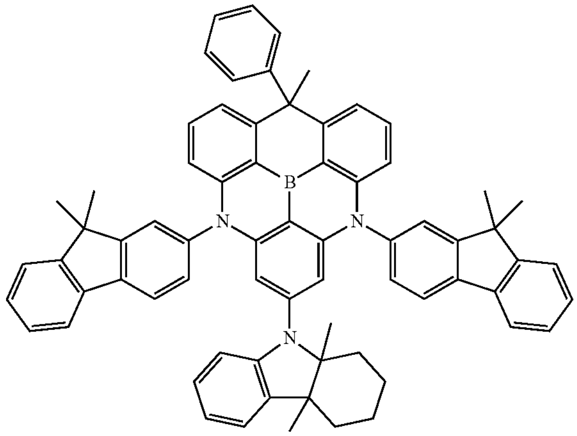
-continued
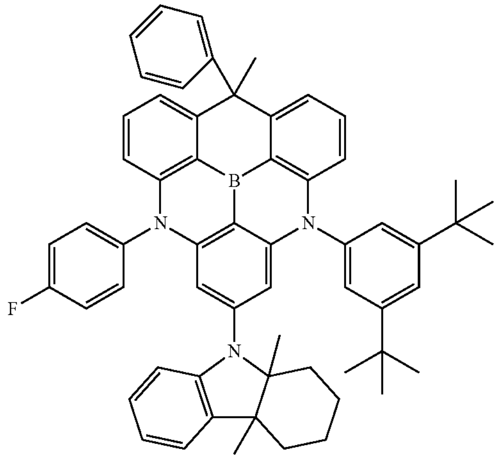
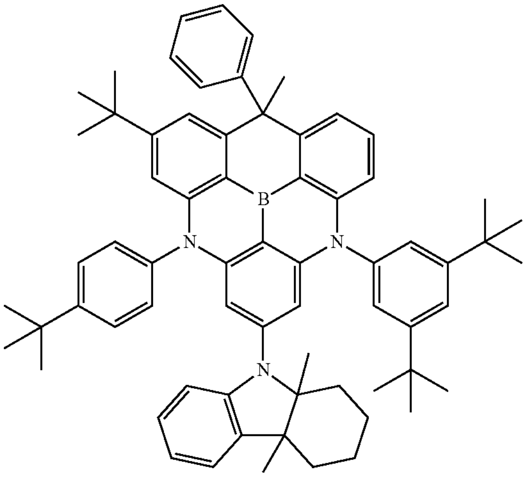
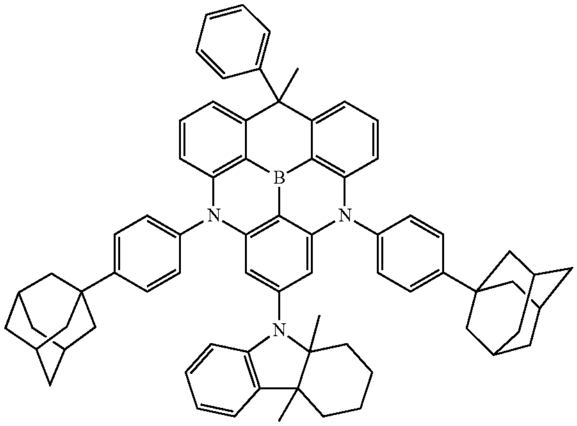
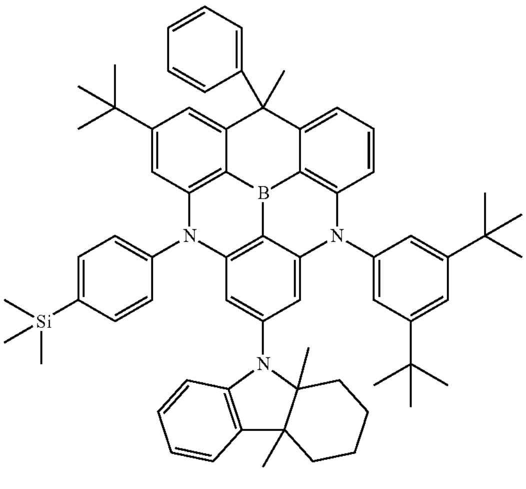
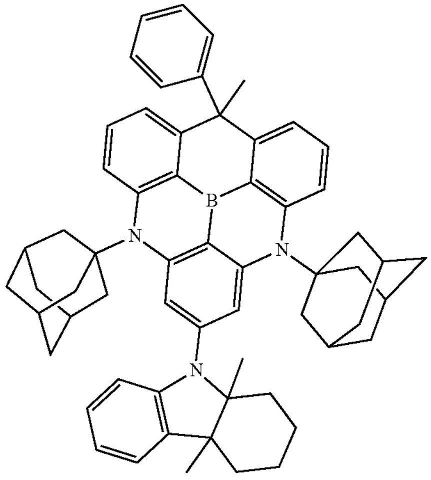

-continued
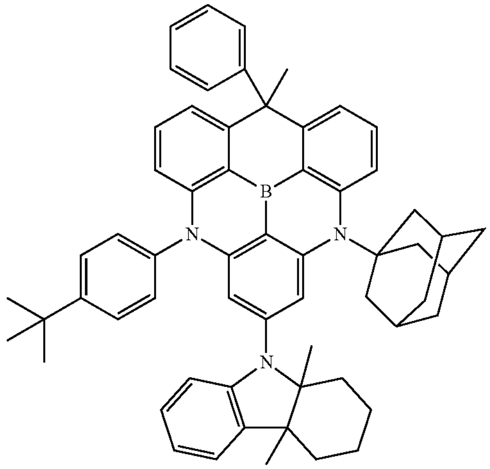
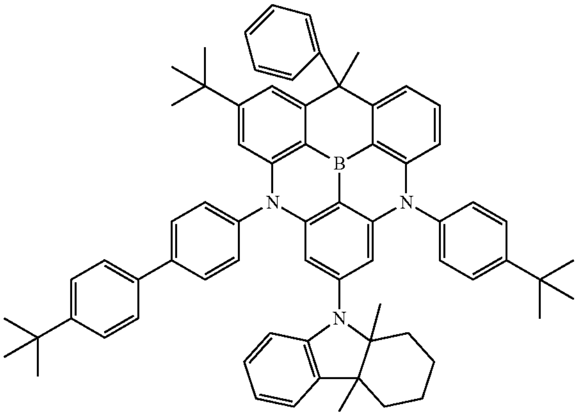
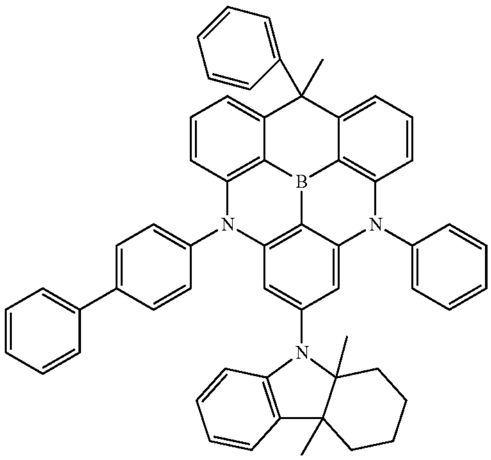
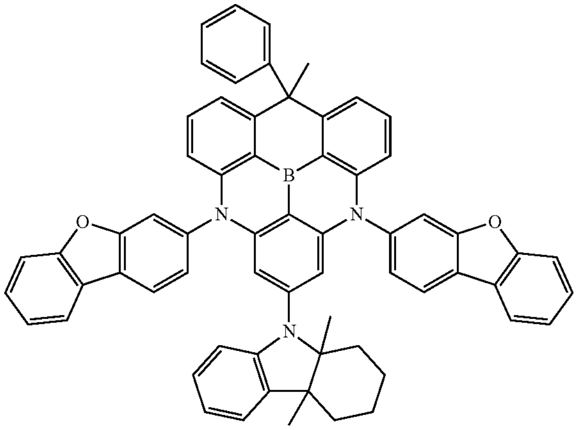
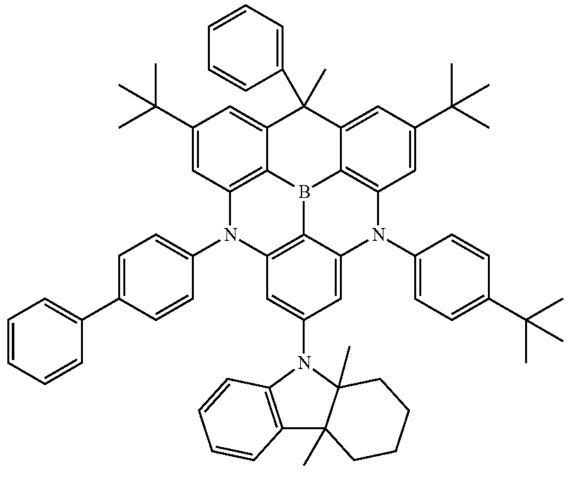
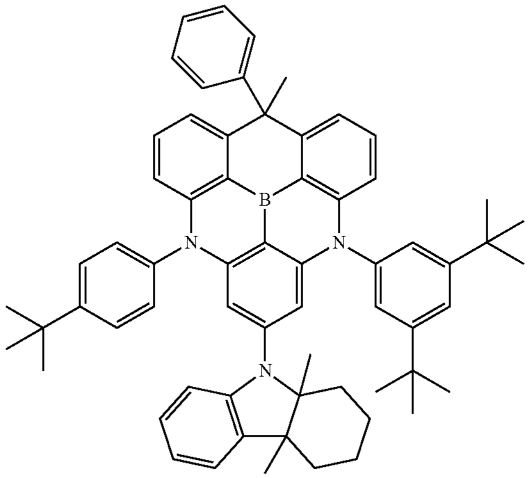

-continued
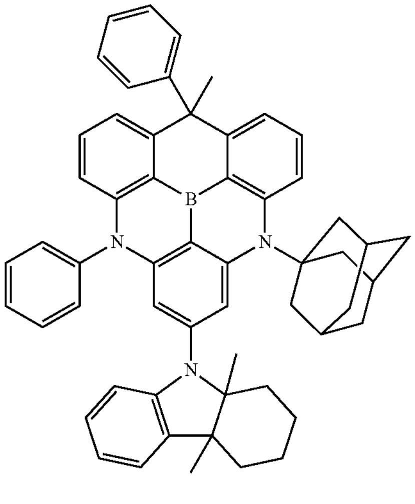
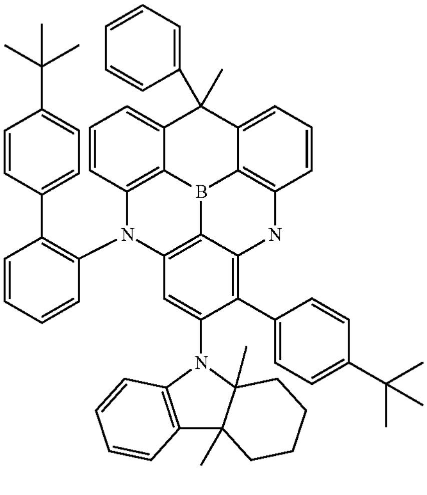
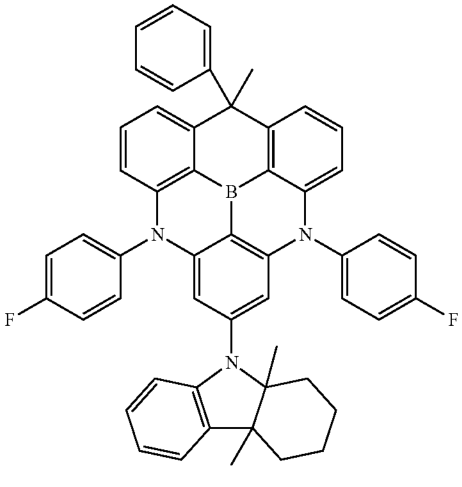
-continued
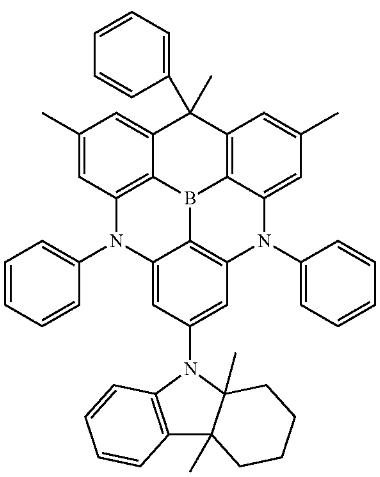
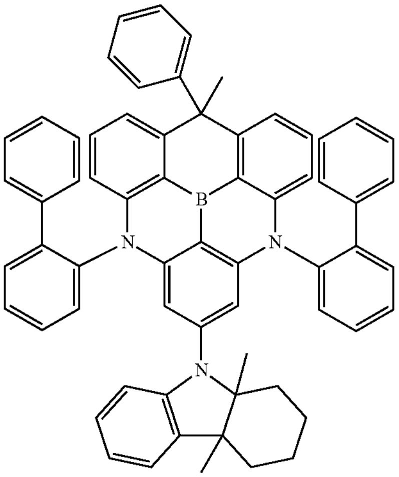
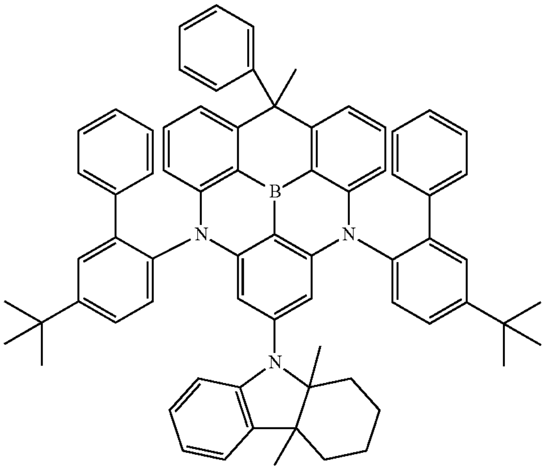

-continued
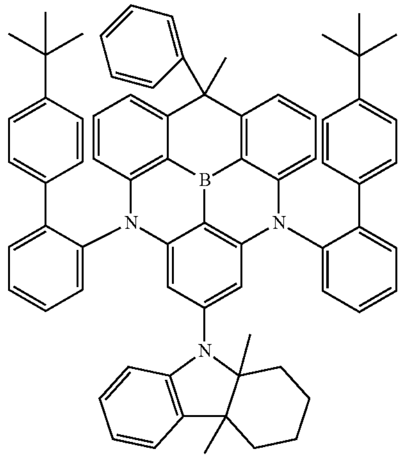
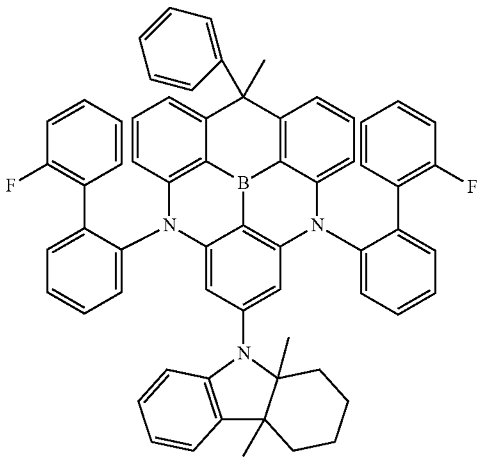
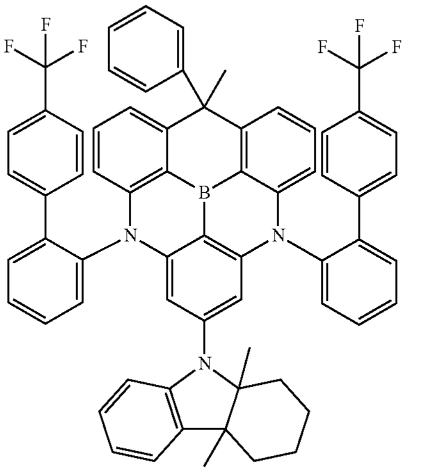
-continued
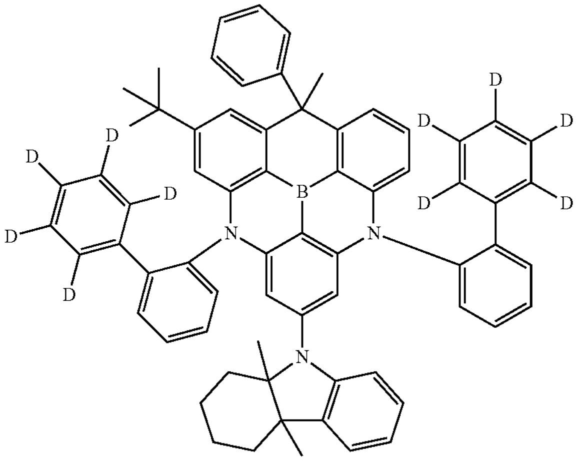
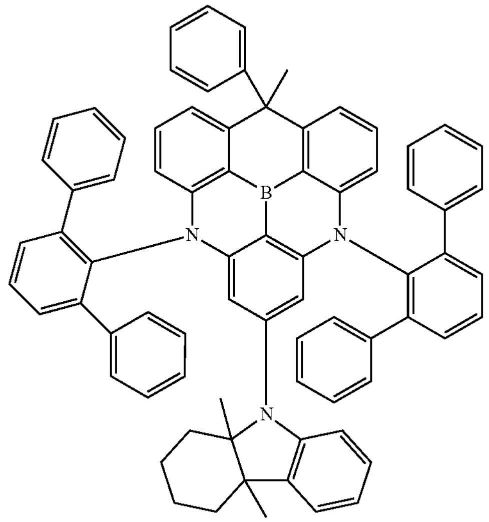
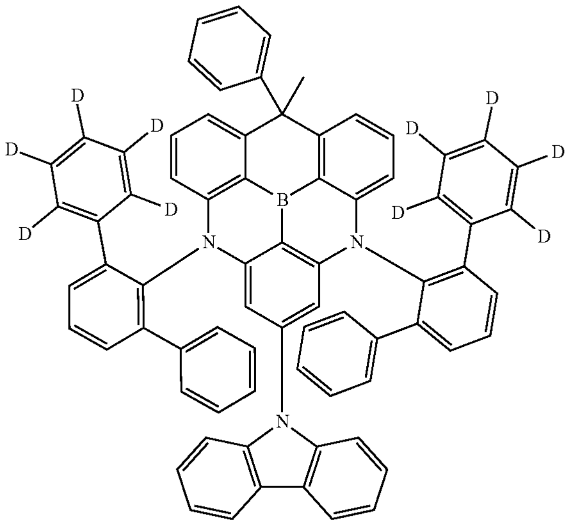

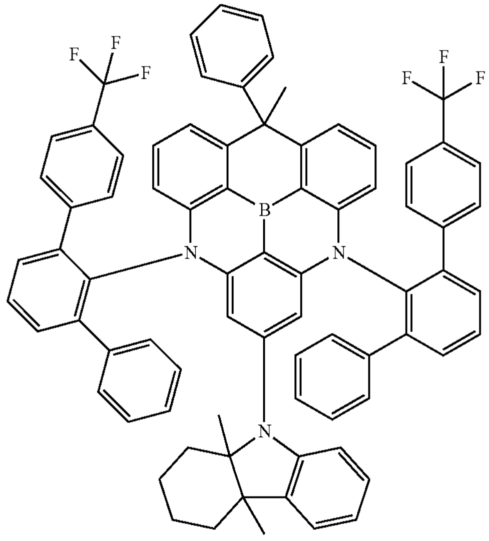
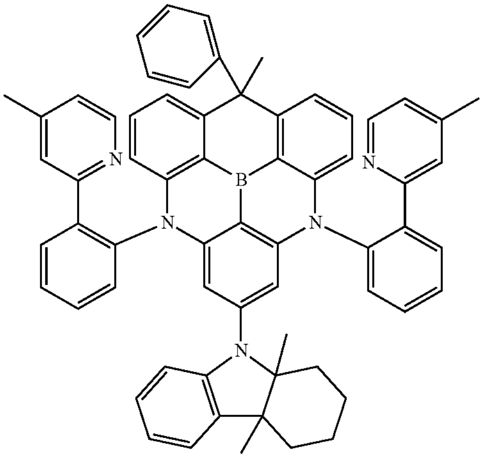
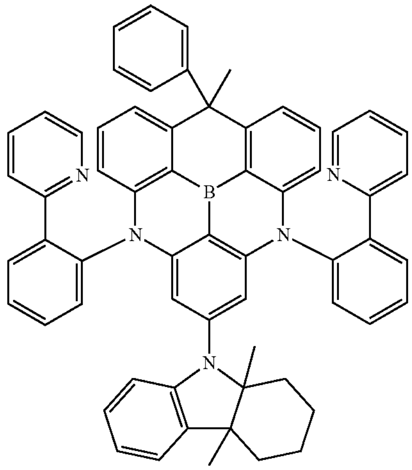
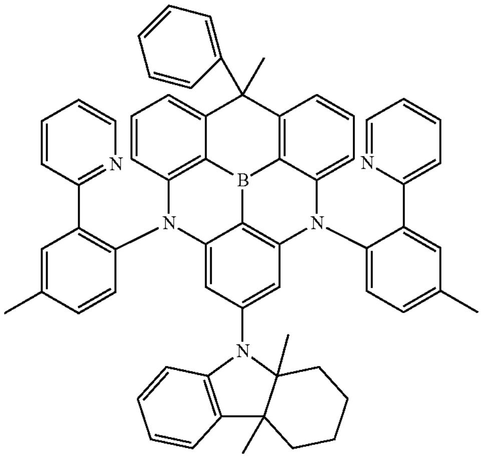
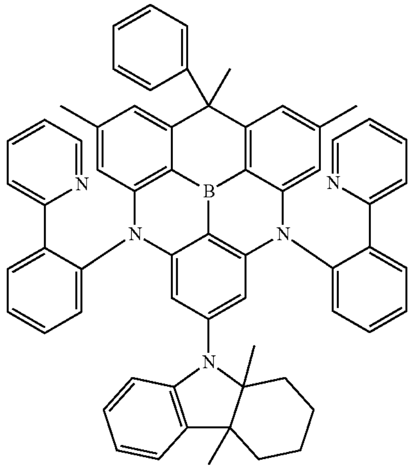
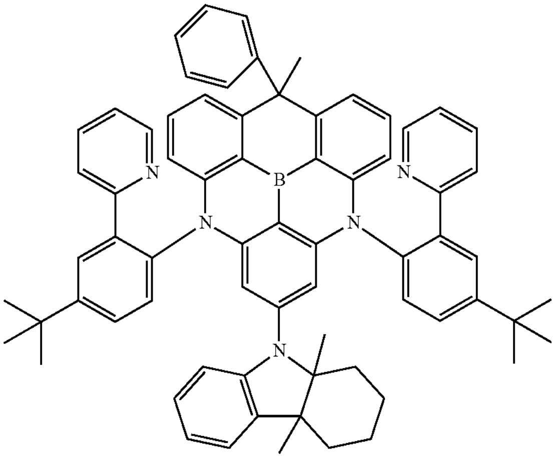

-continued
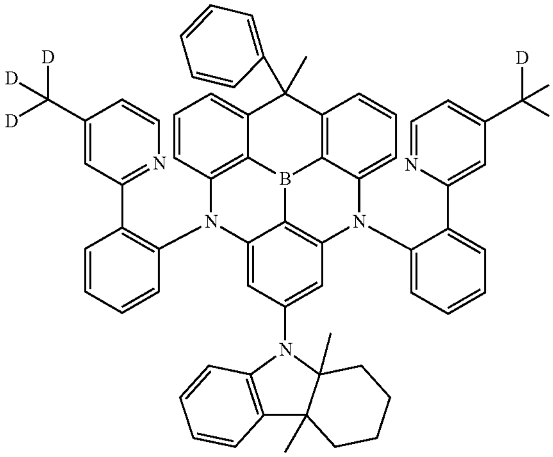
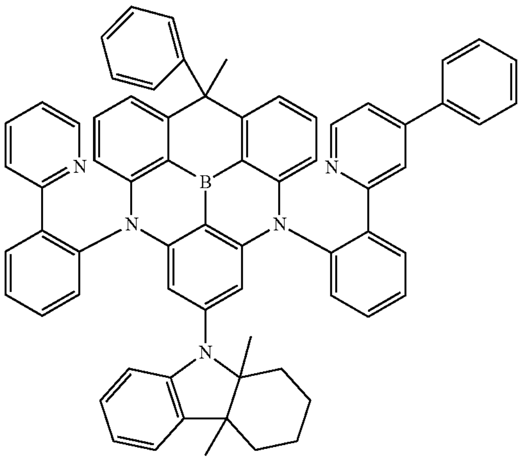
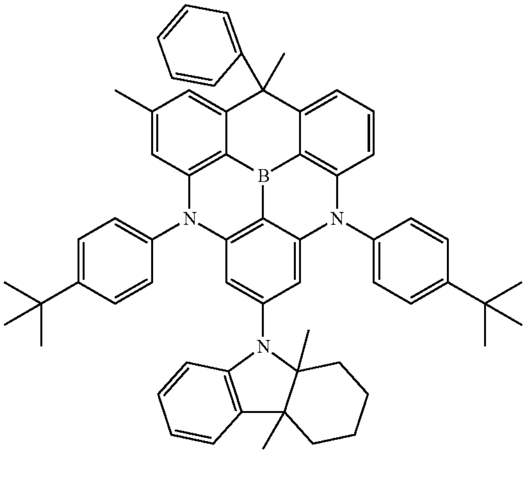
-continued
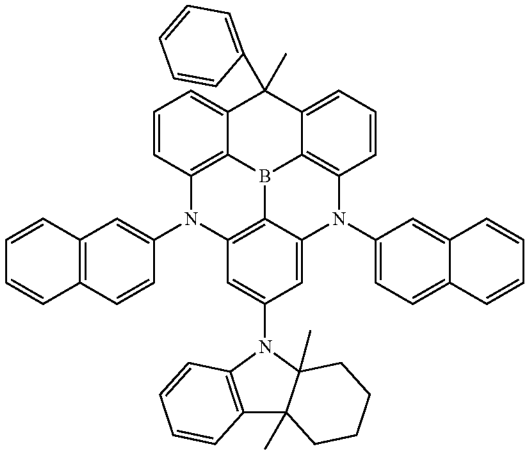
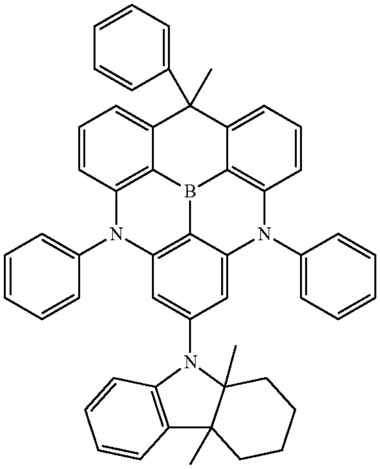
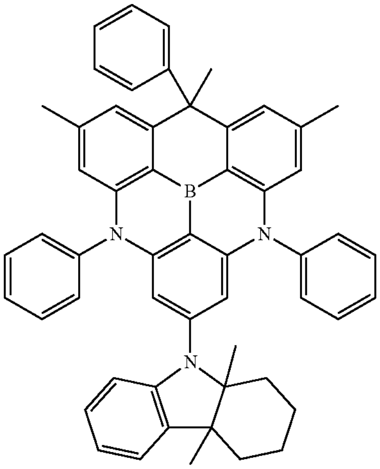

-continued
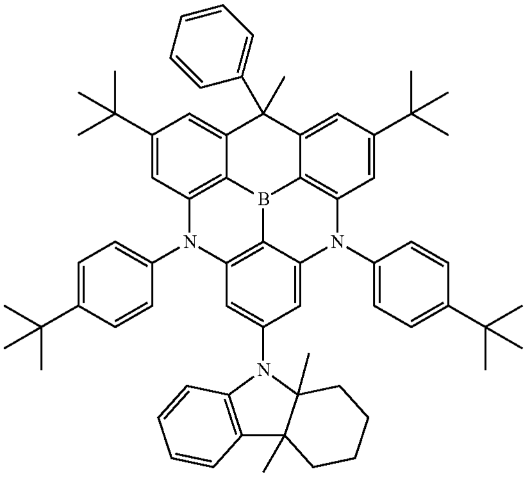
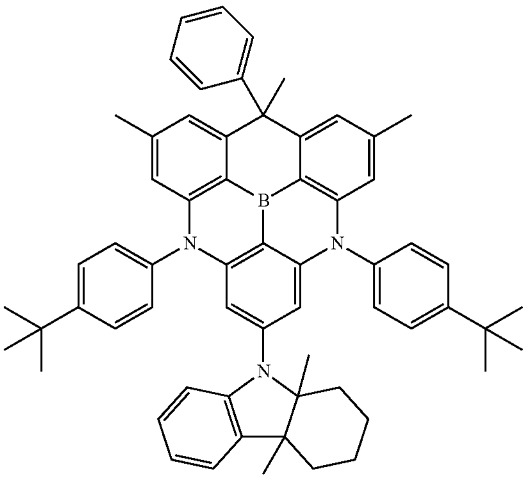
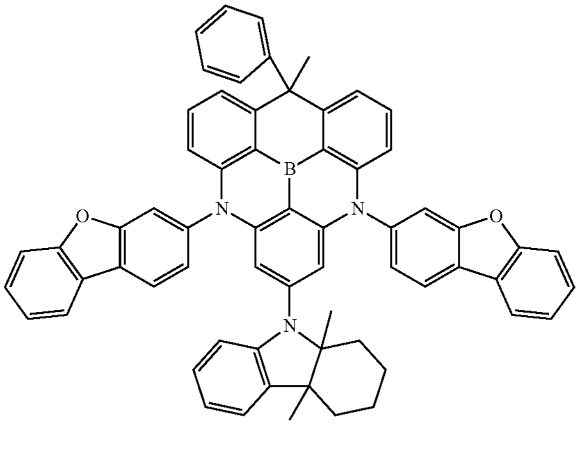
-continued
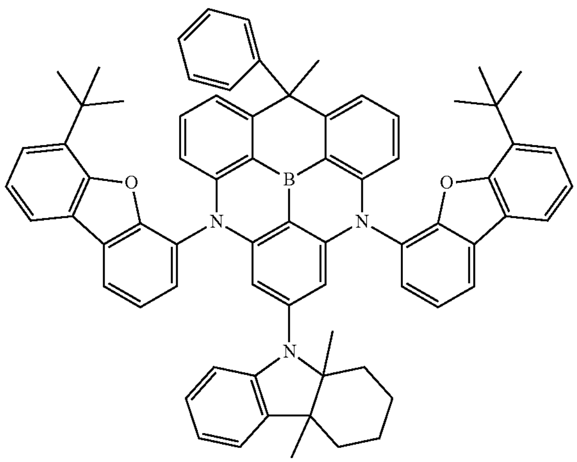
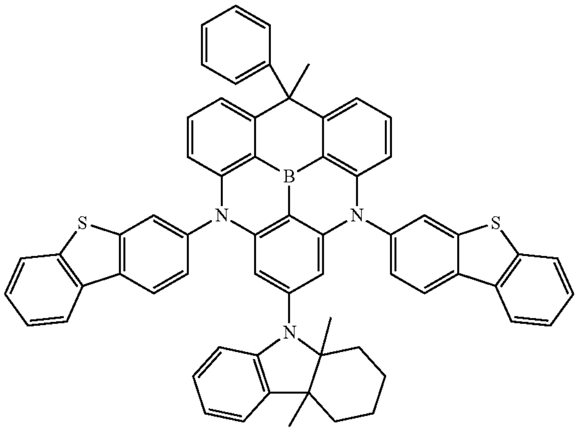
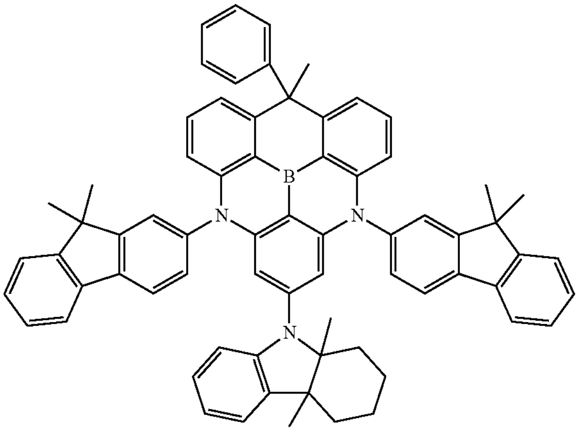

-continued
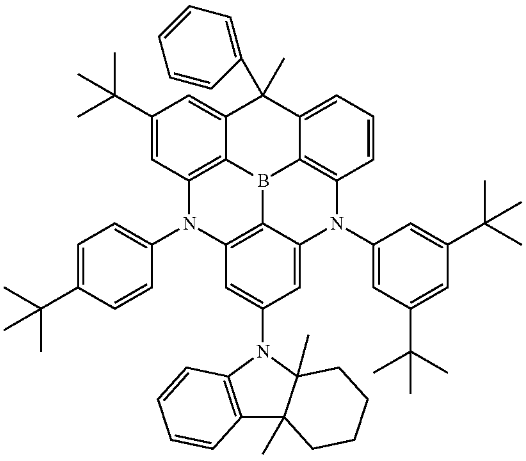
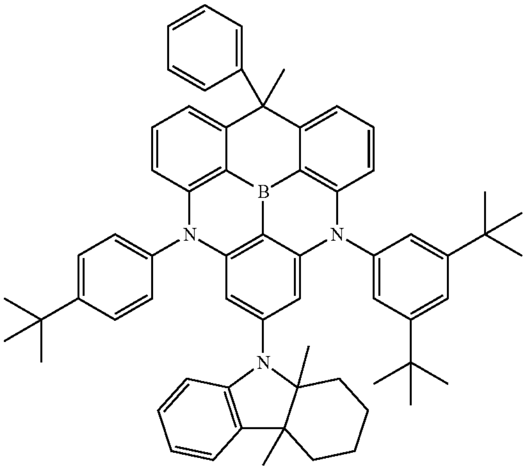
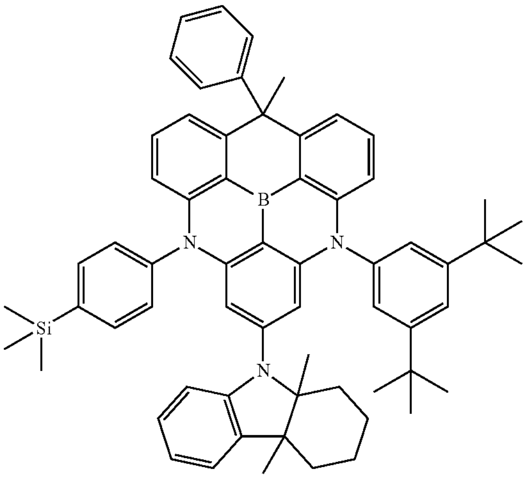
-continued
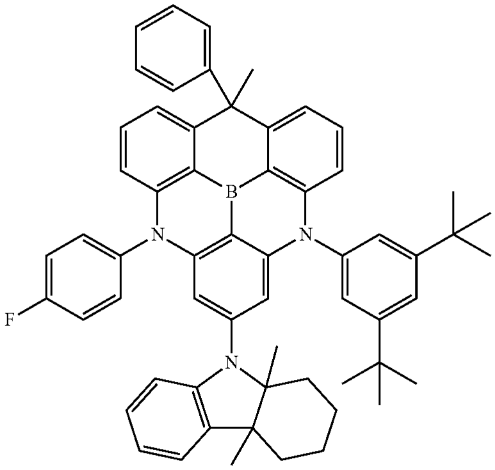
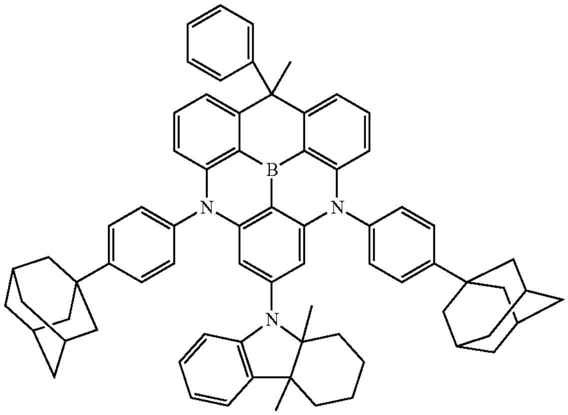
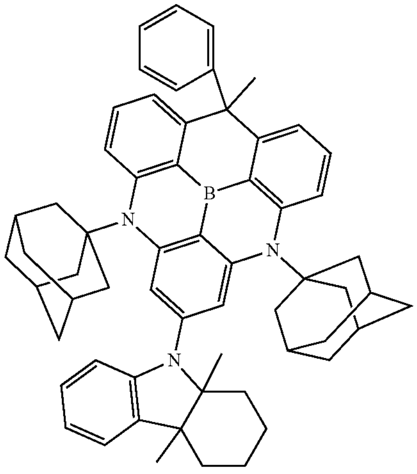

-continued
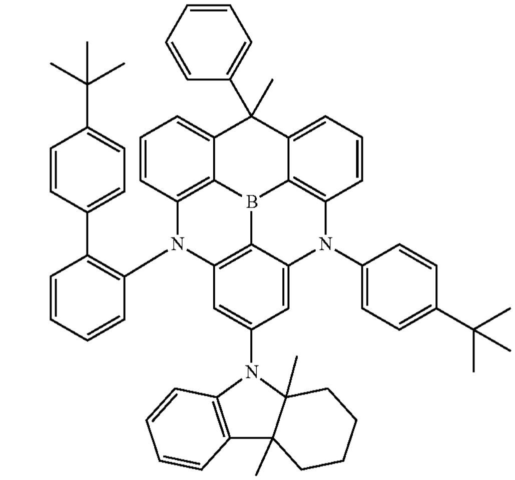
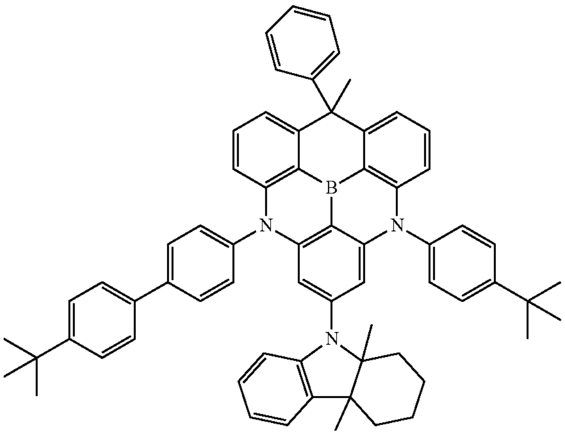
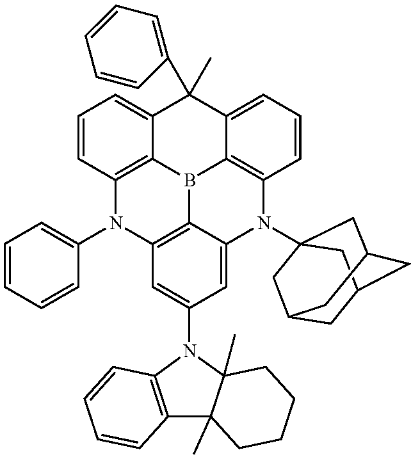
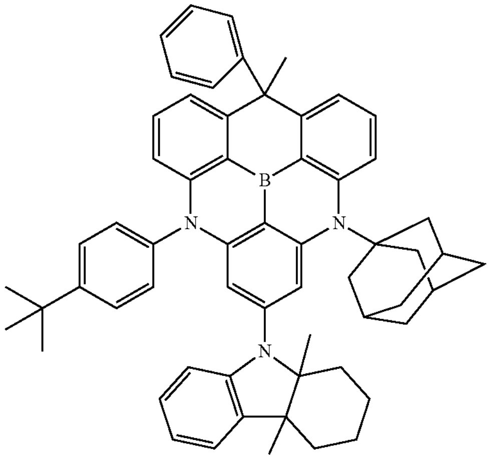
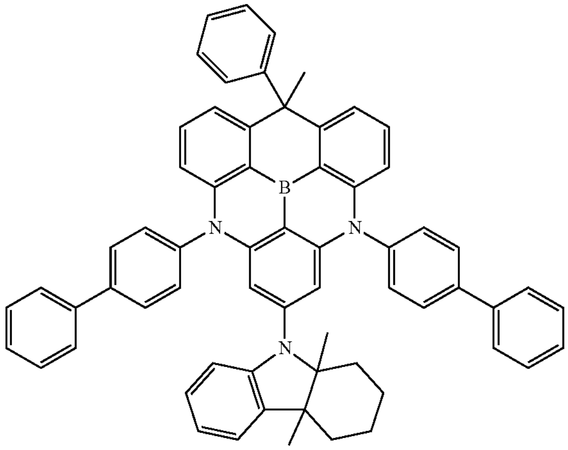
-continued
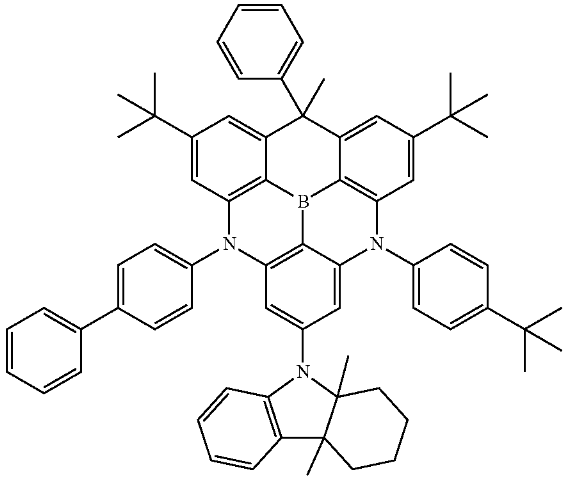

-continued
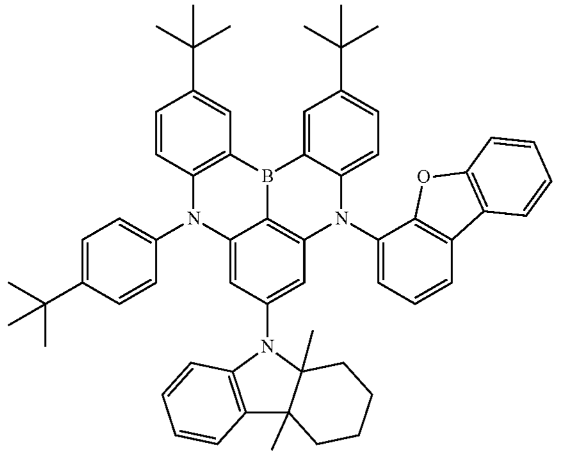
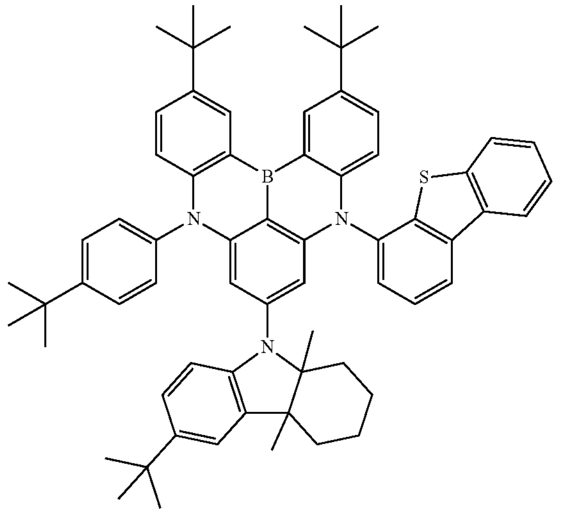
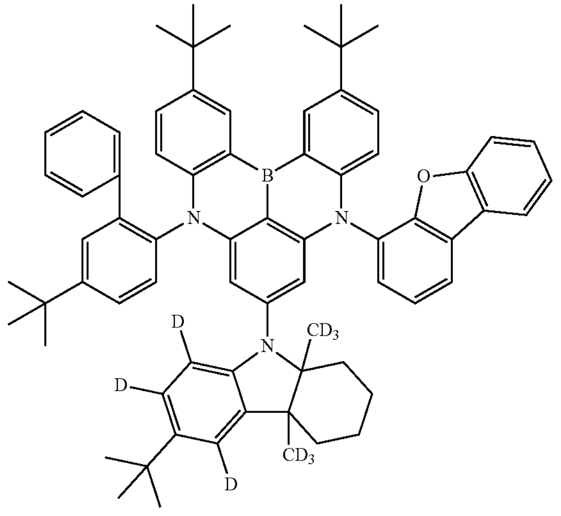
-continued
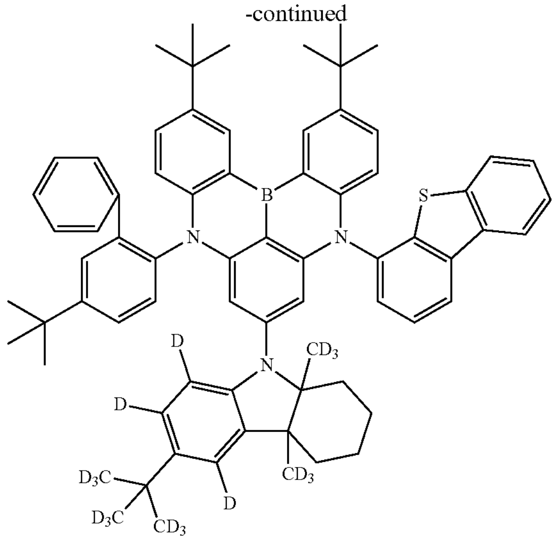
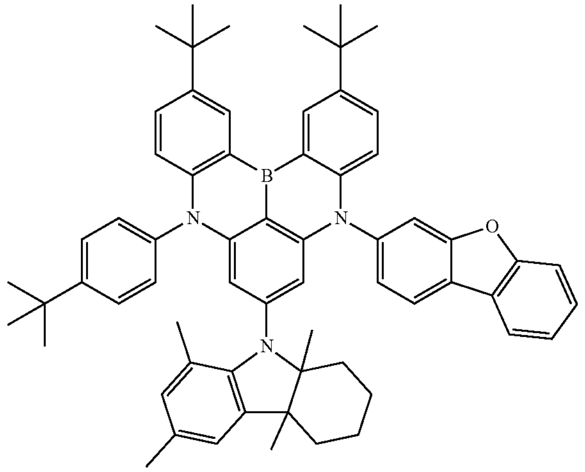
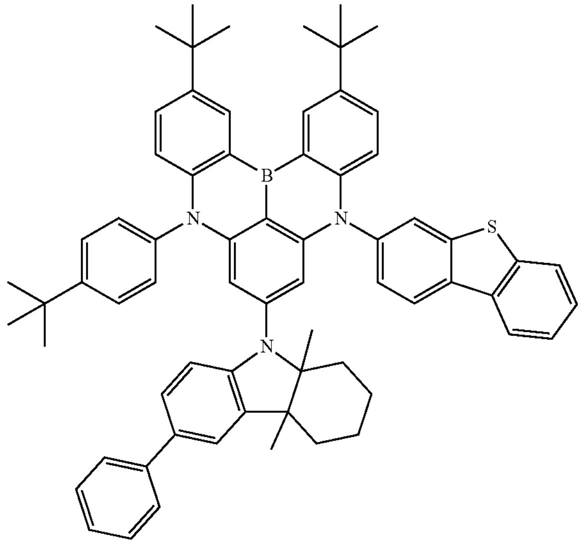

-continued
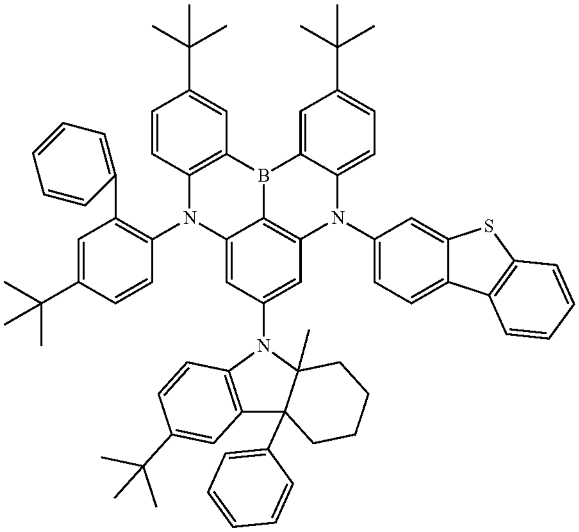
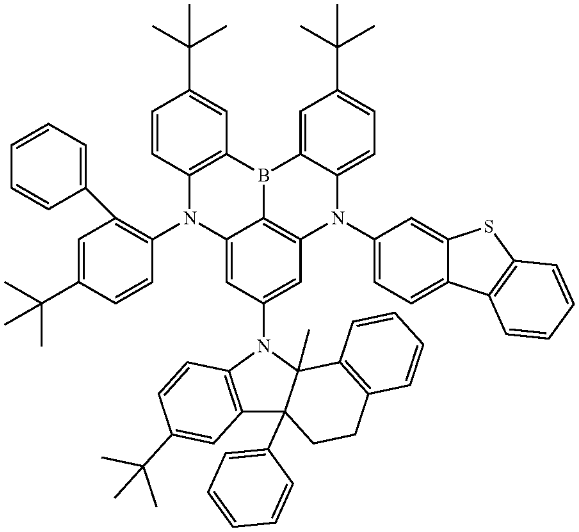
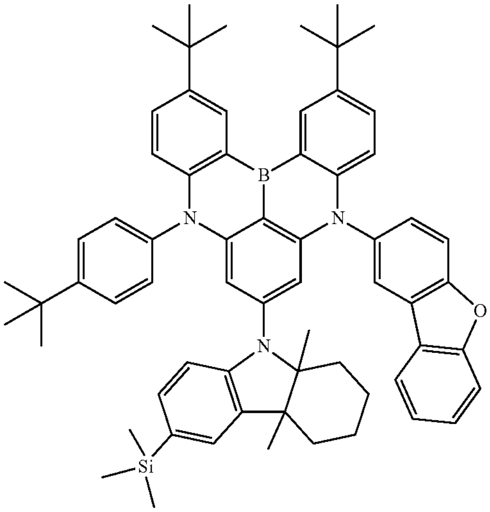
-continued
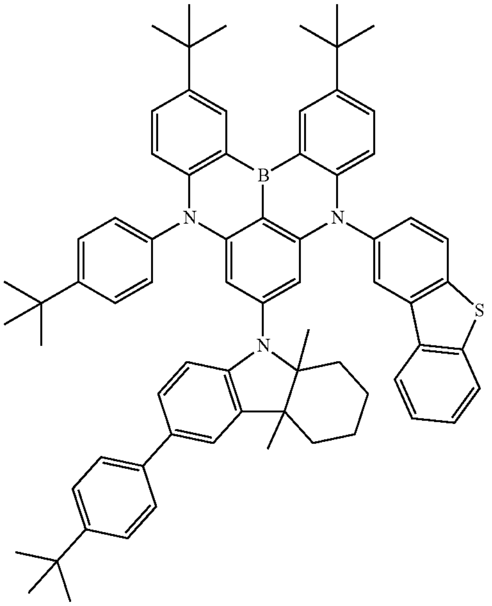
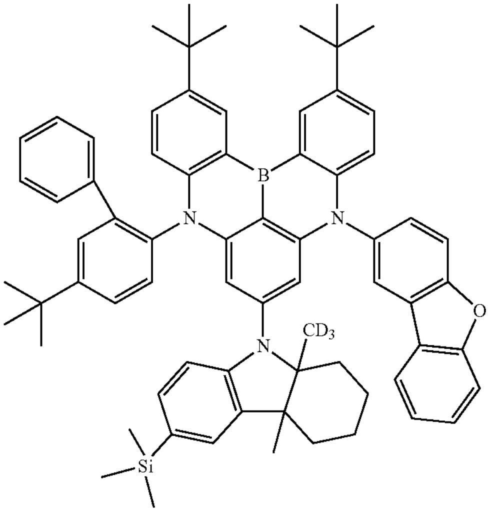
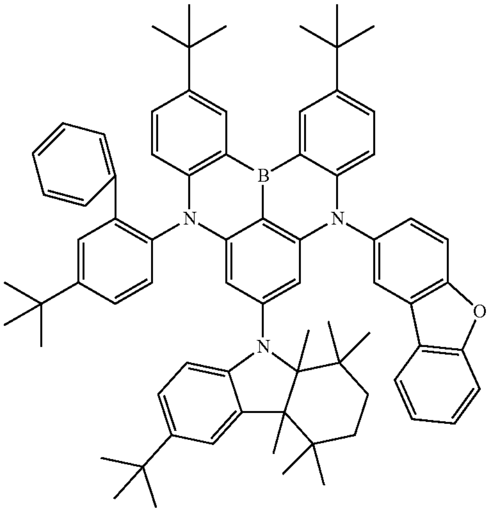

-continued
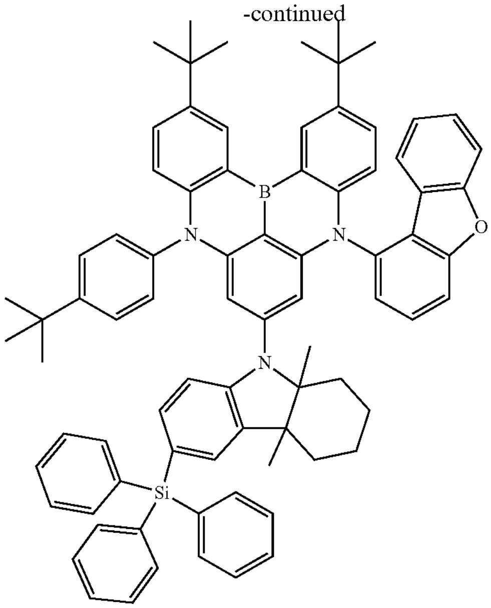
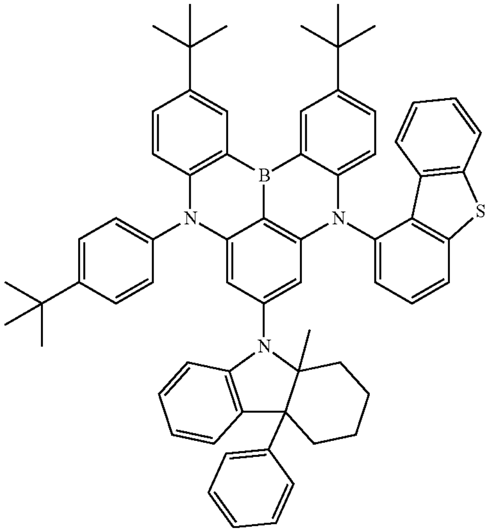
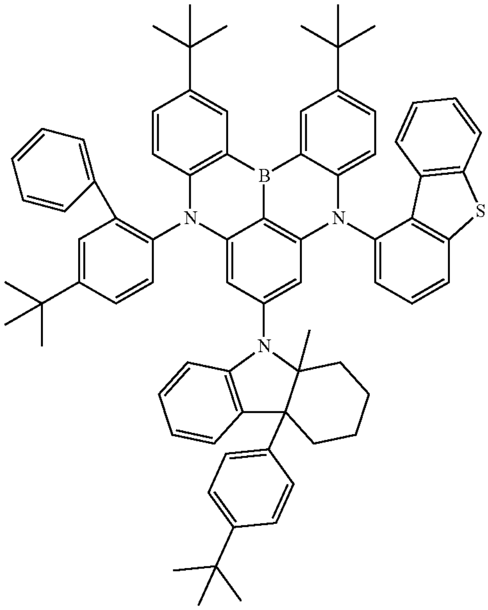
-continued
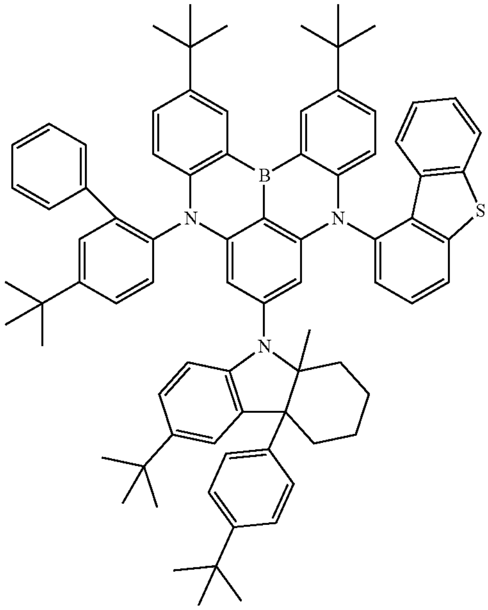
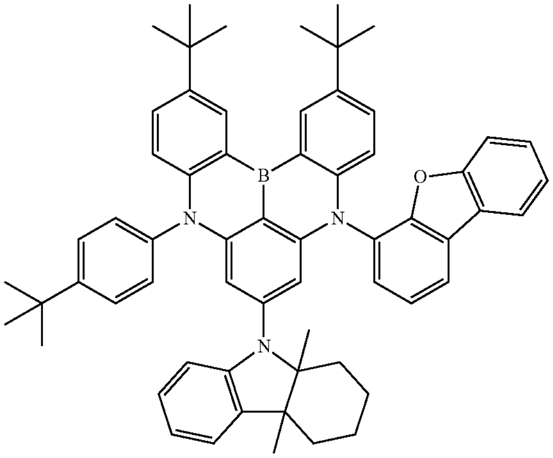
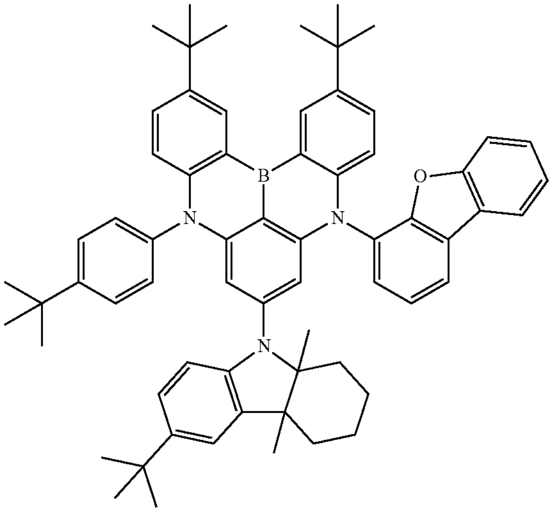

-continued
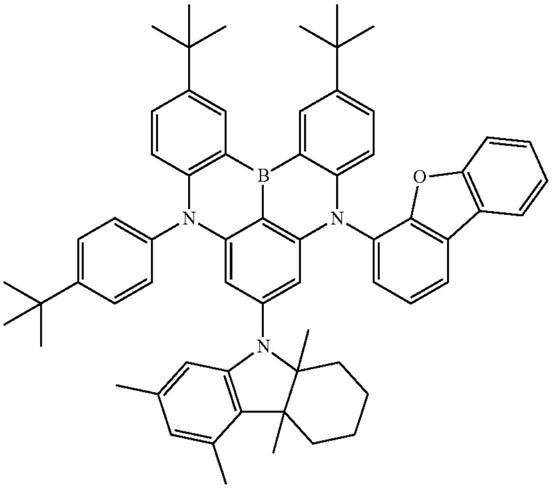
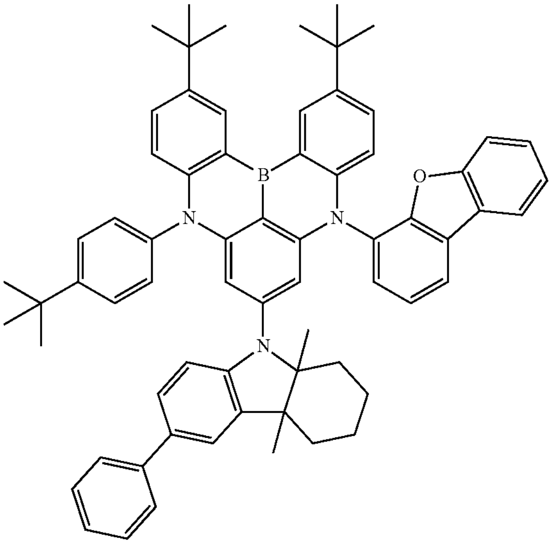
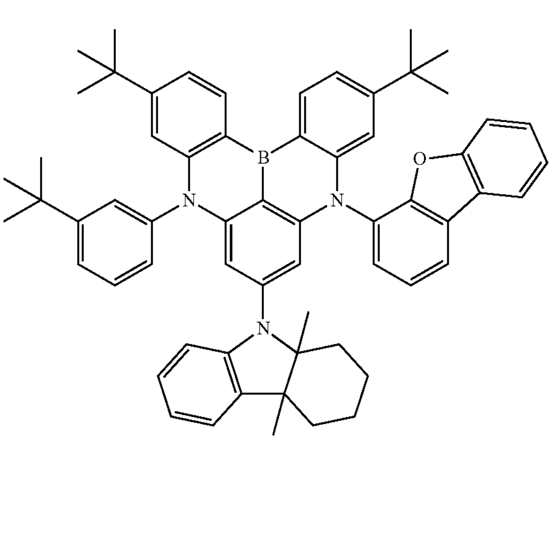
-continued
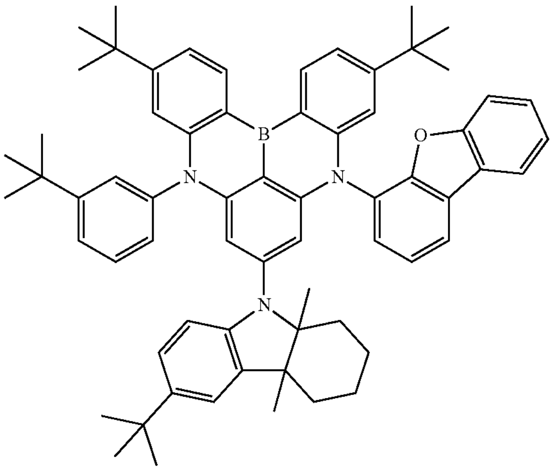
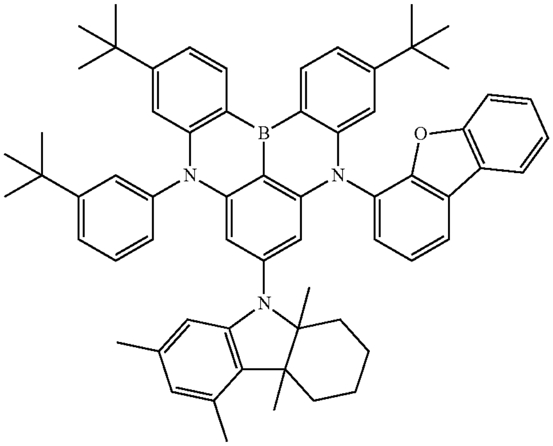
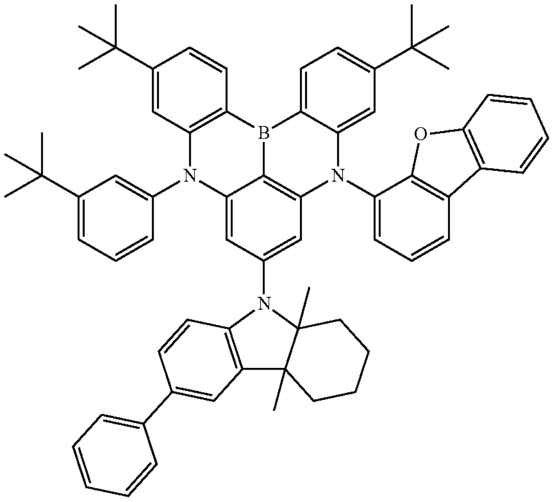

-continued
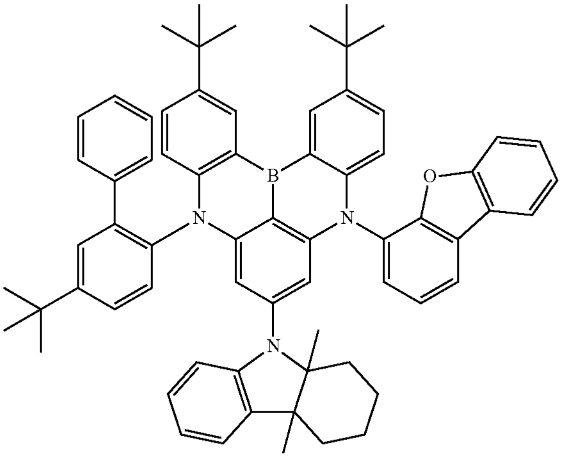
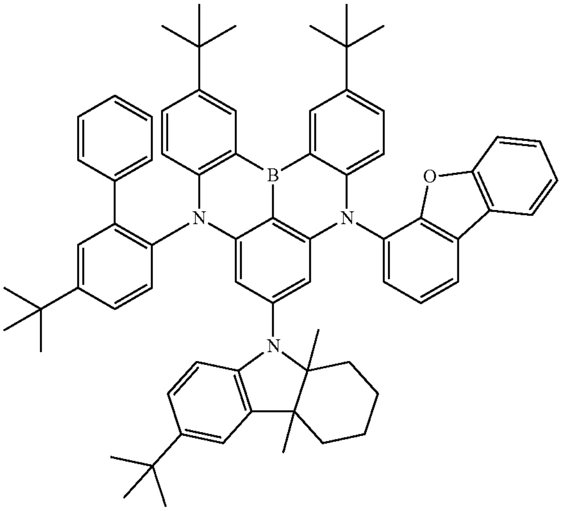
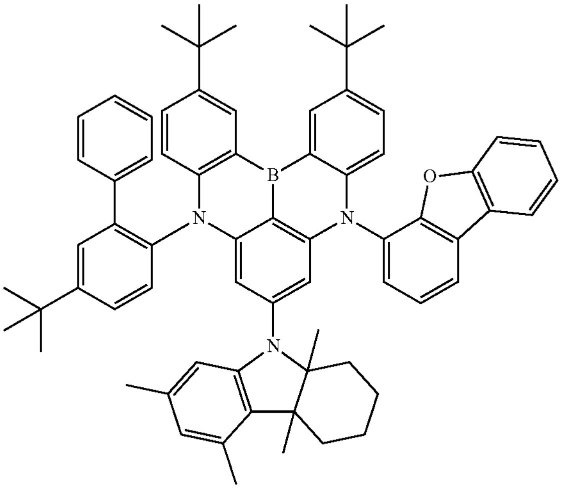
-continued
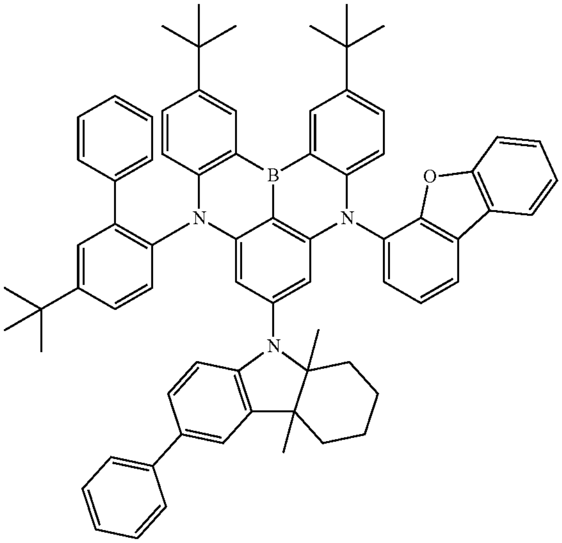
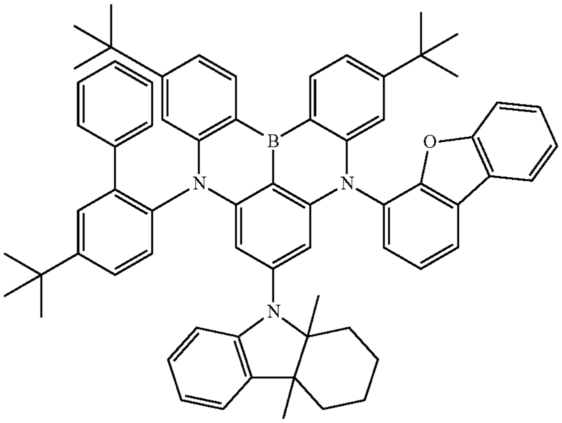
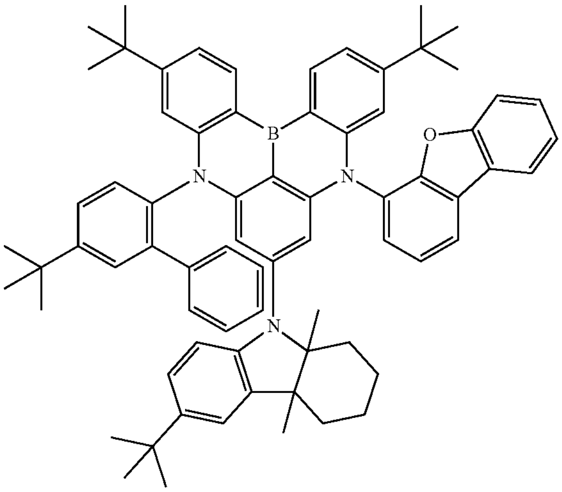

-continued
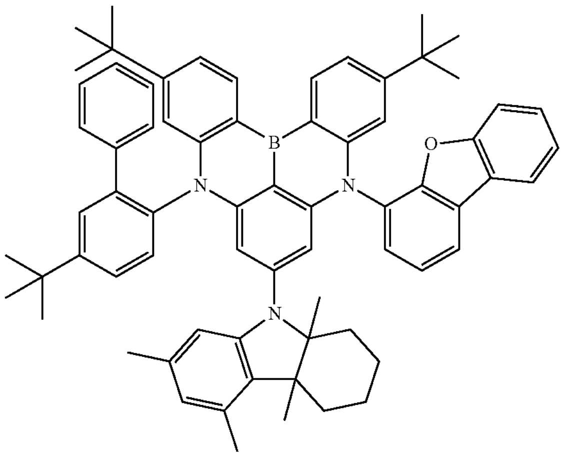
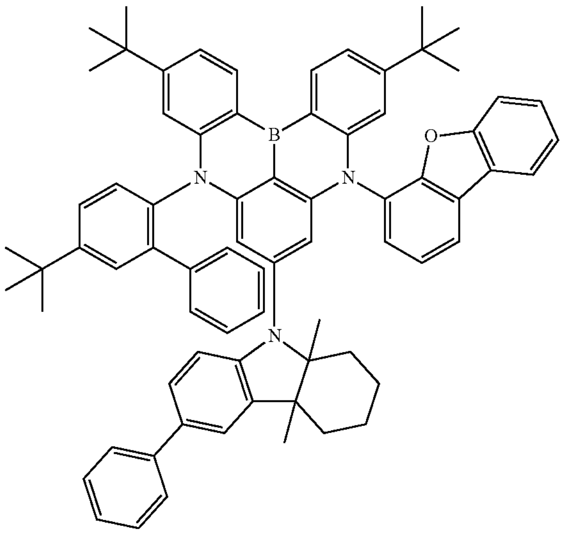
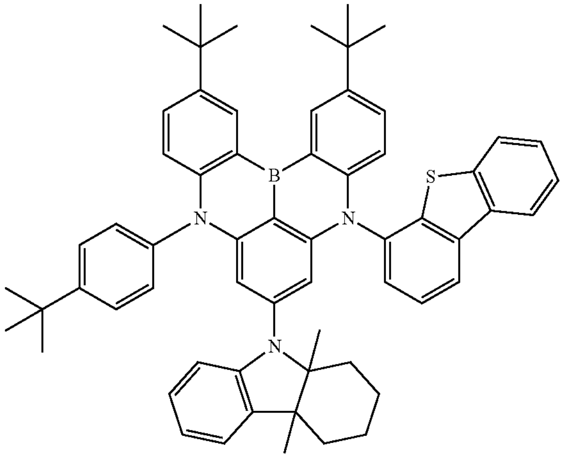
-continued
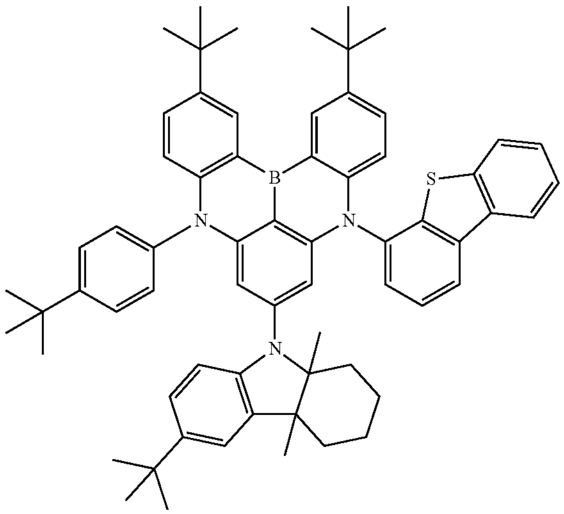
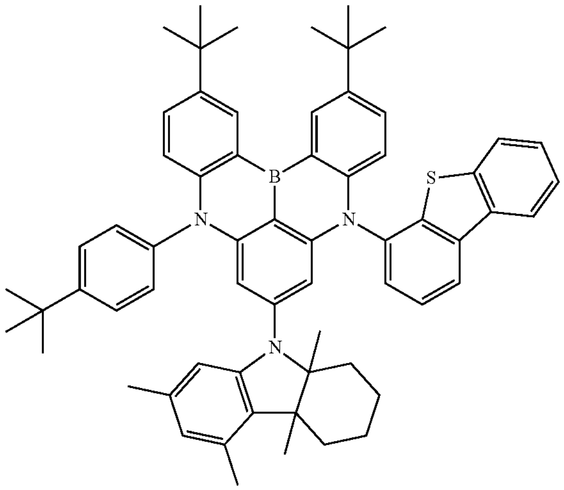
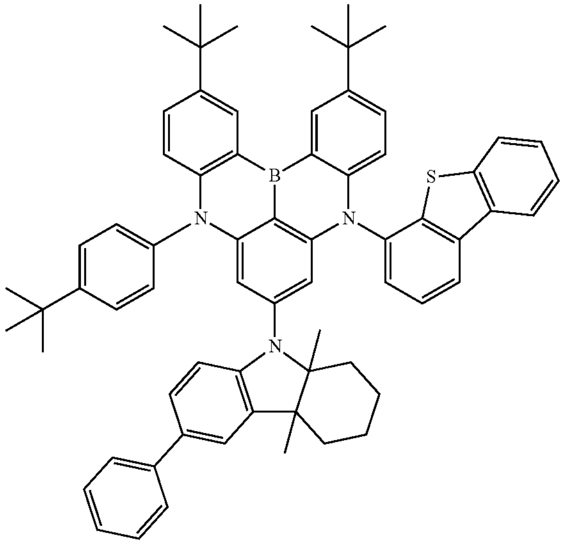

-continued
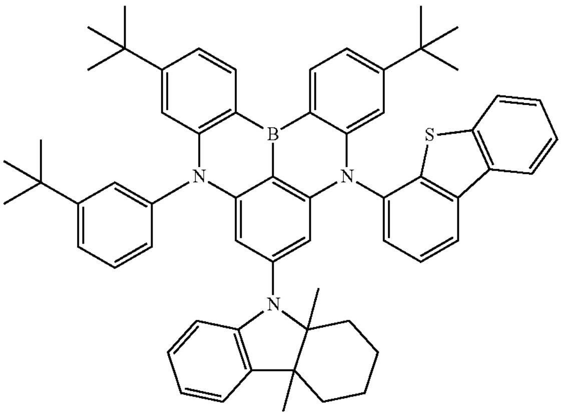
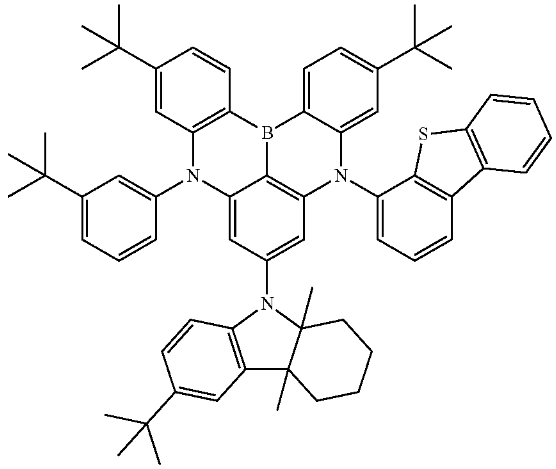
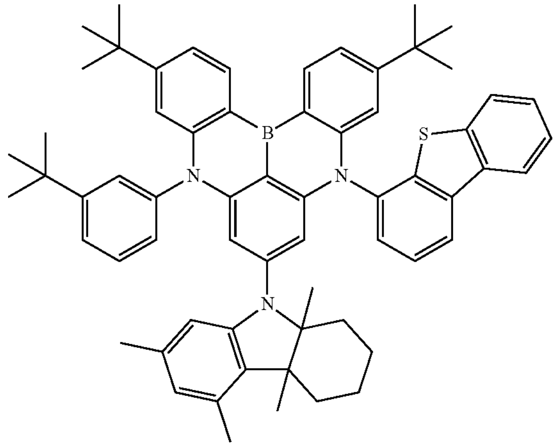
-continued
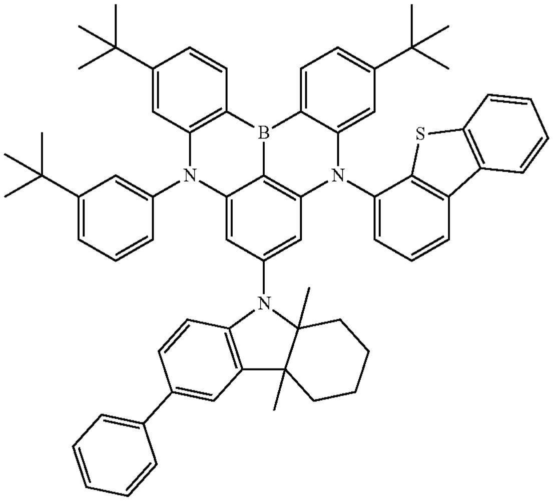
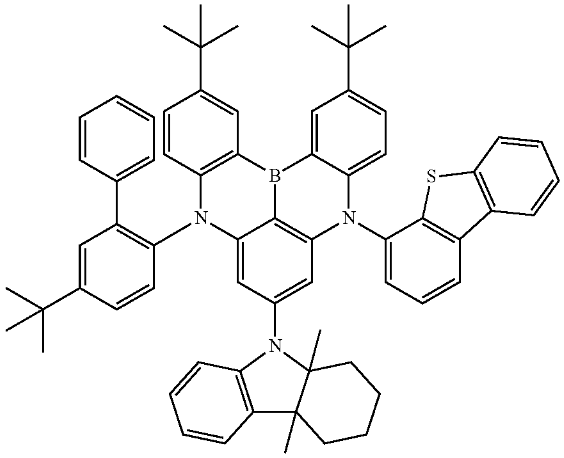
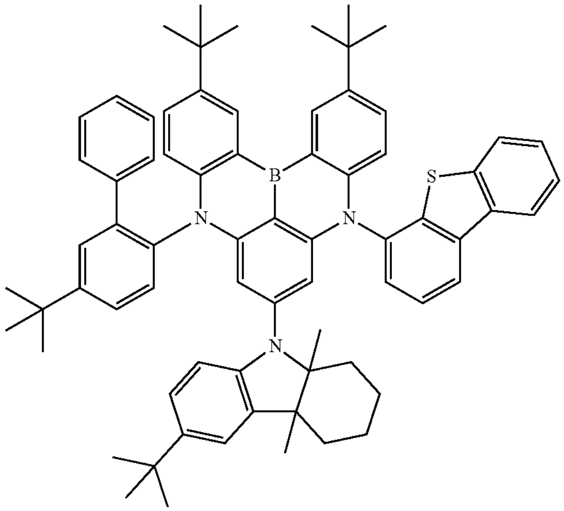

-continued
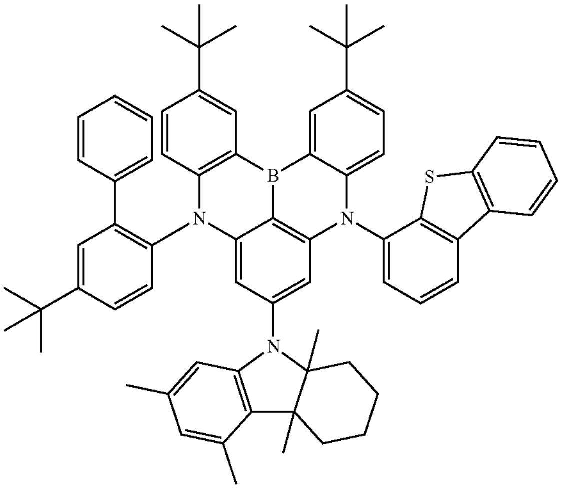
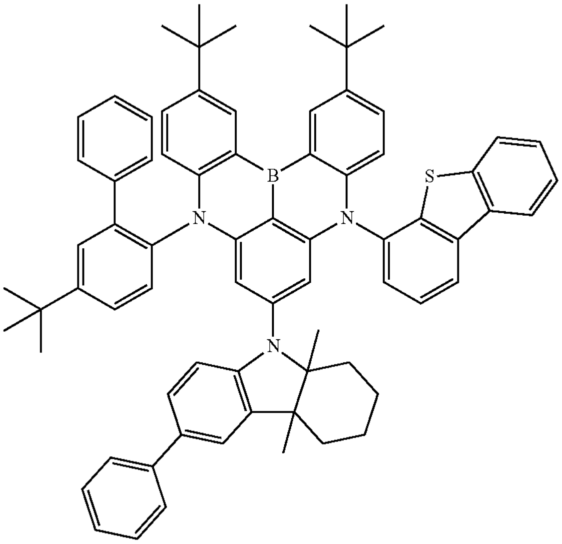
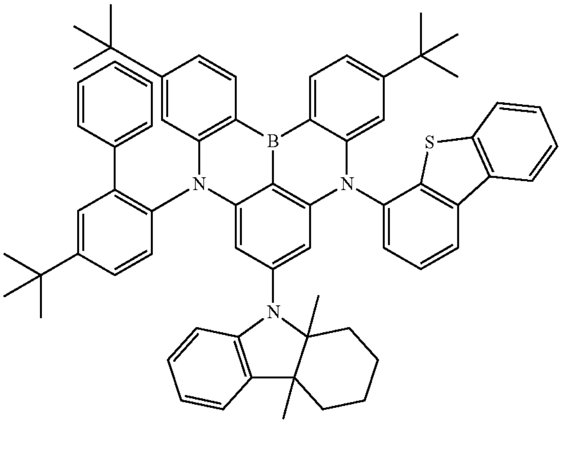
-continued
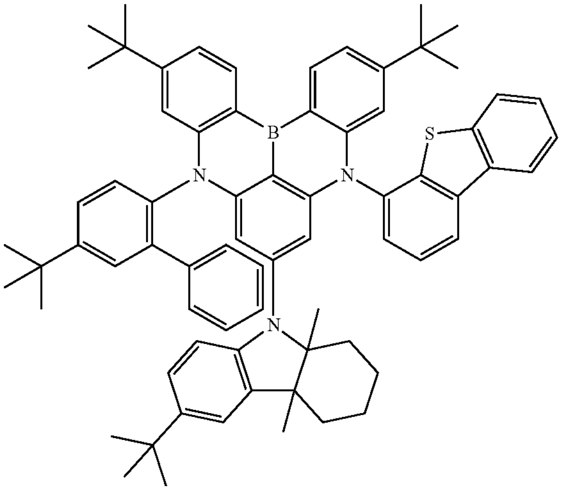
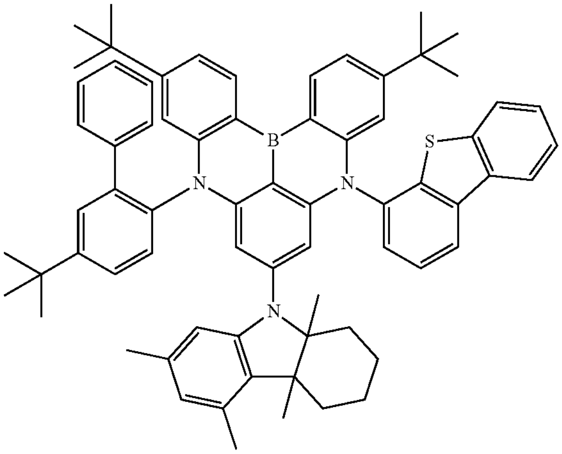
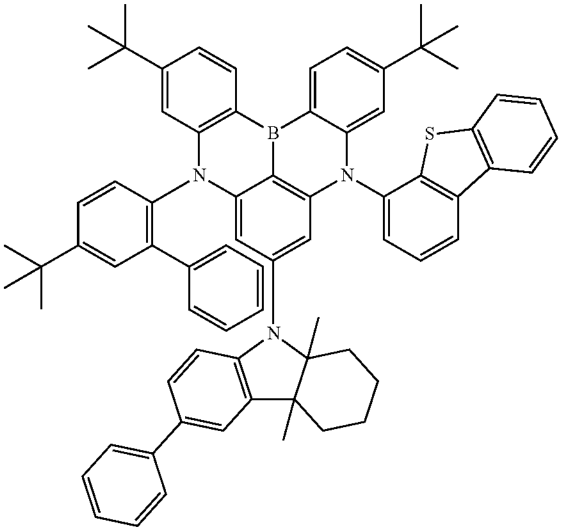

-continued
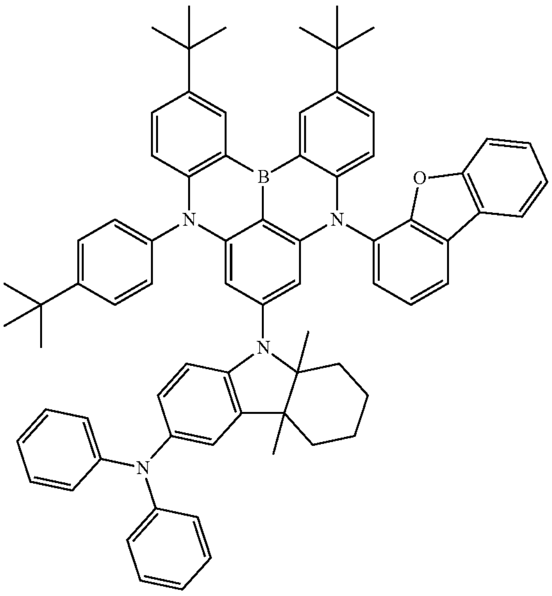
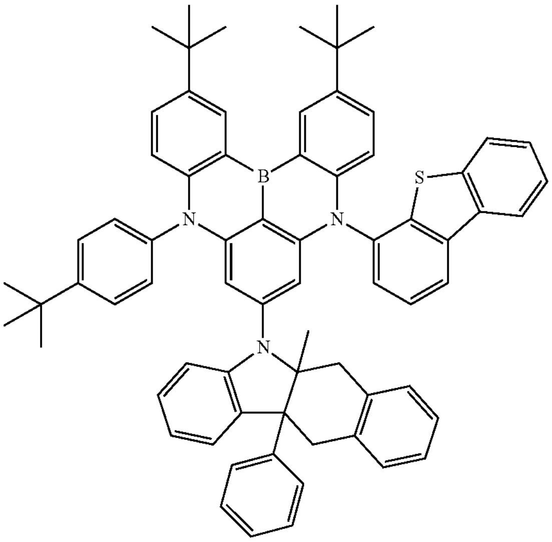
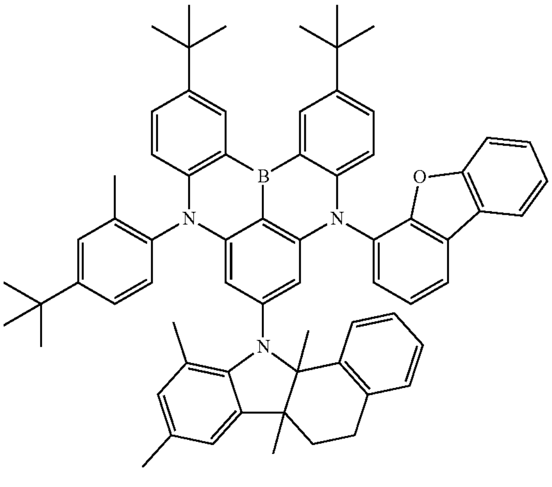
-continued
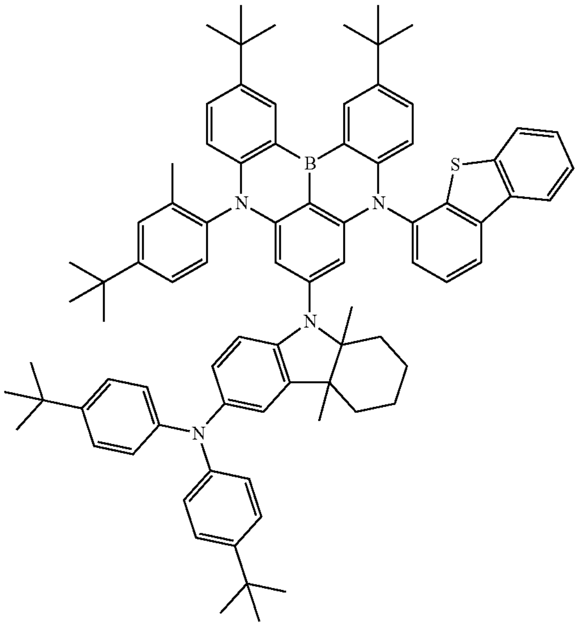
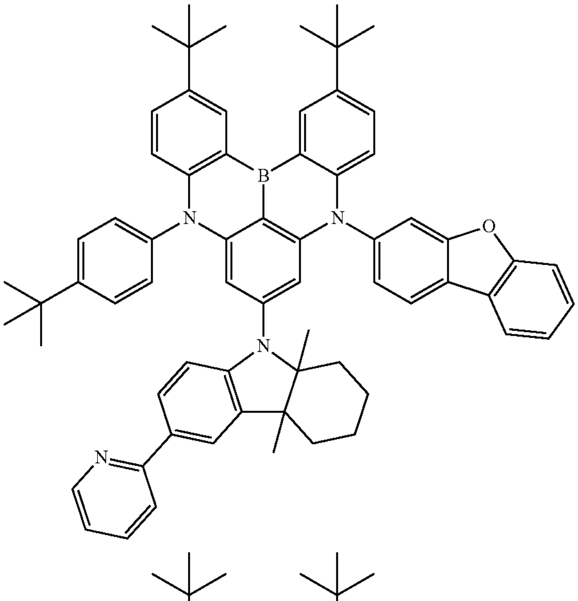
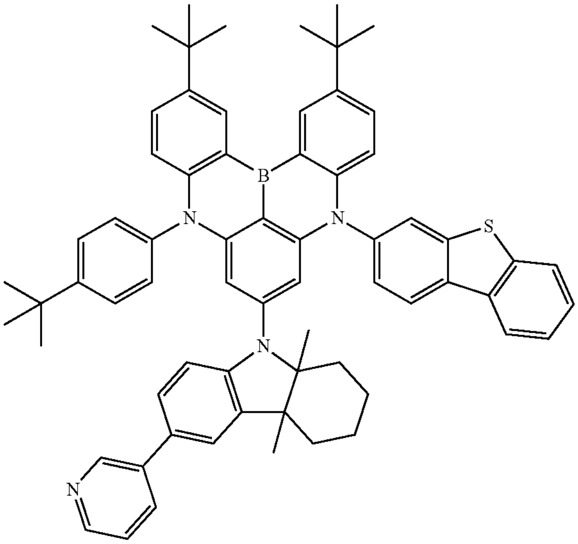

-continued
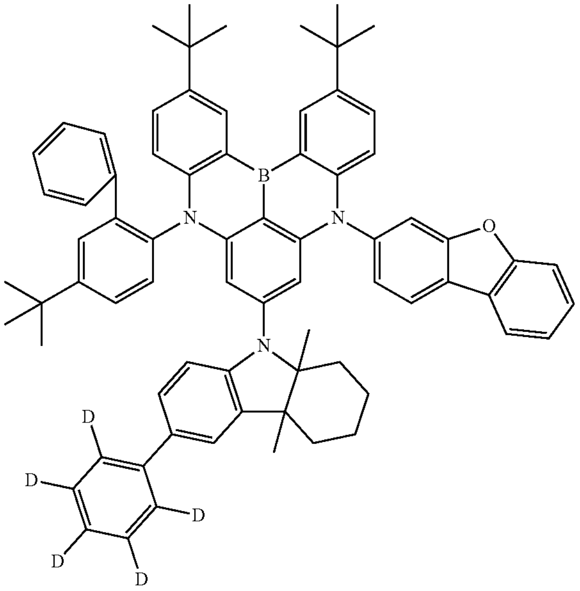
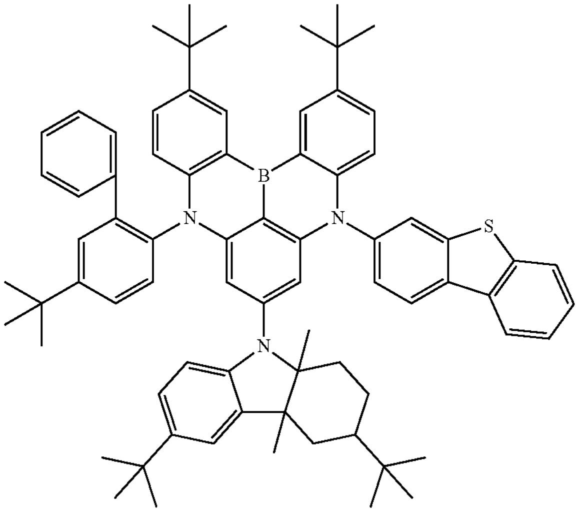
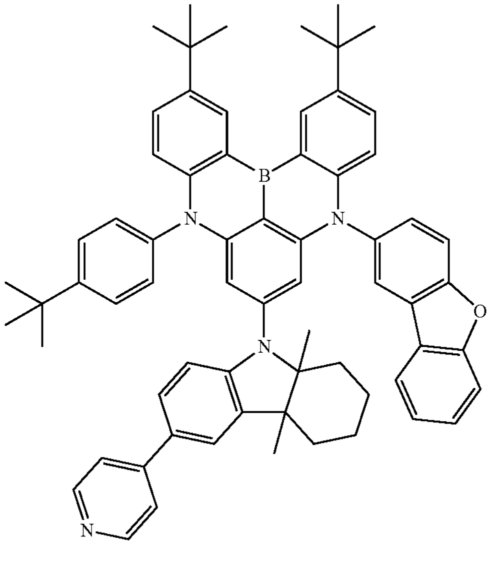
-continued
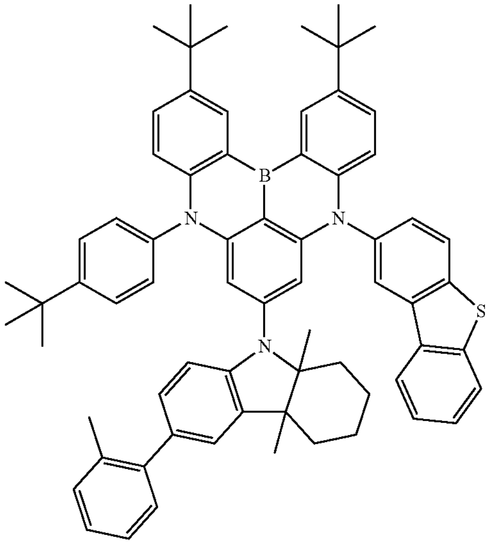
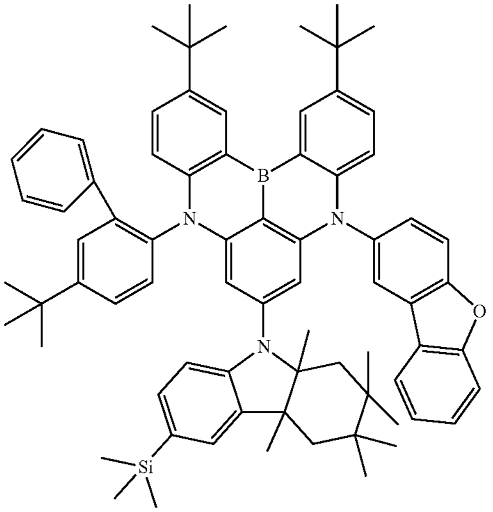
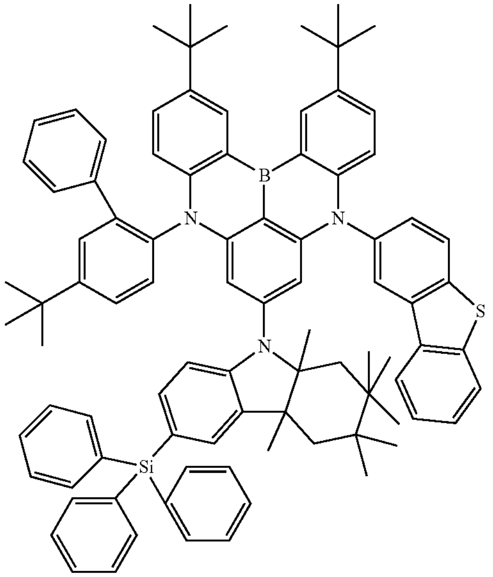

-continued
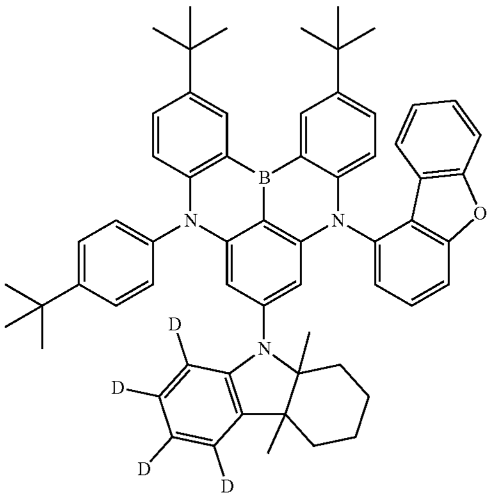
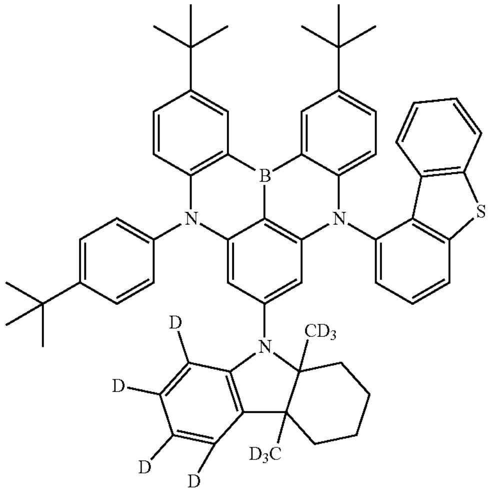
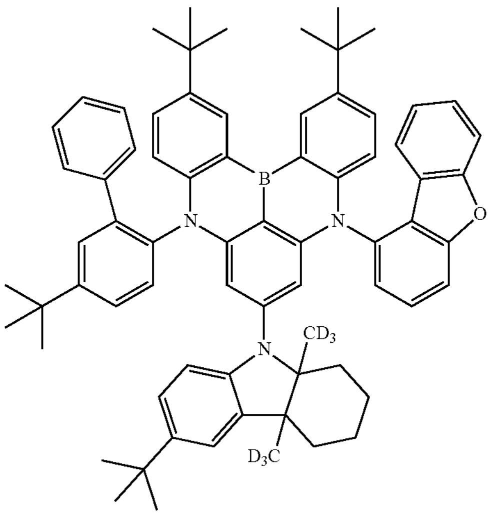
-continued
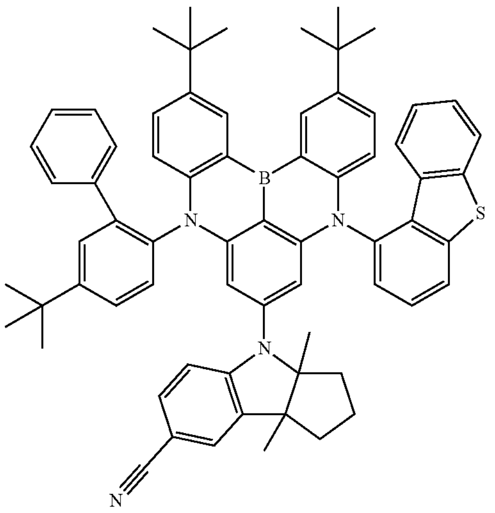
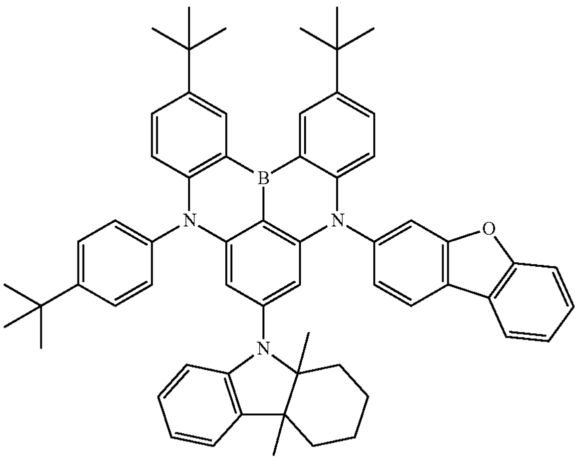
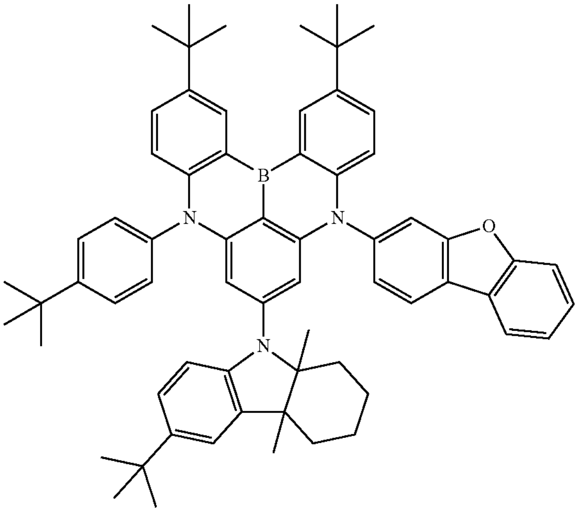

-continued
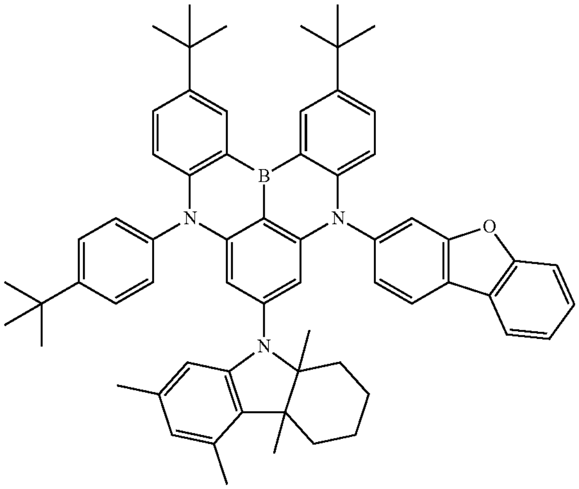
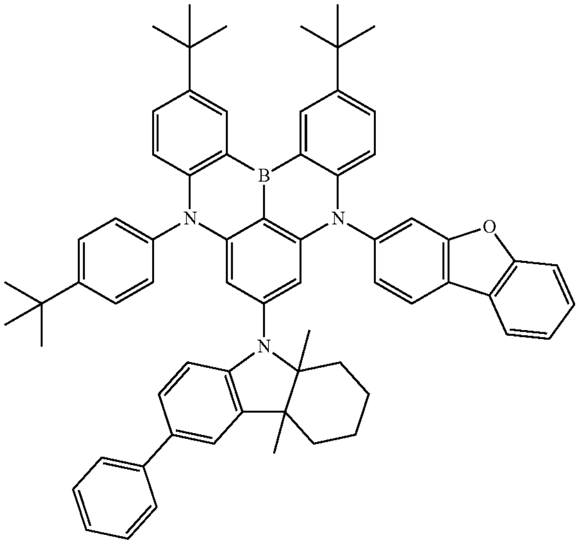
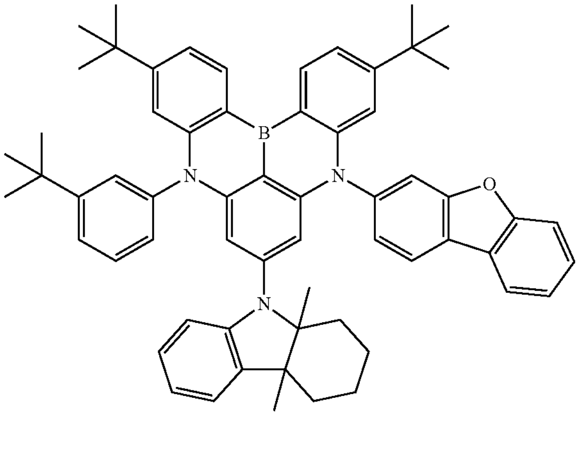
-continued
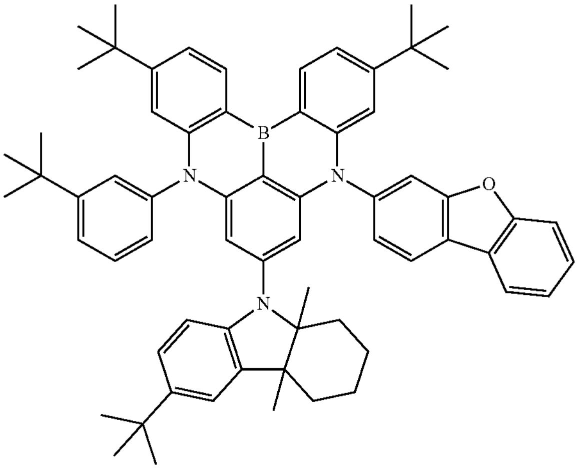
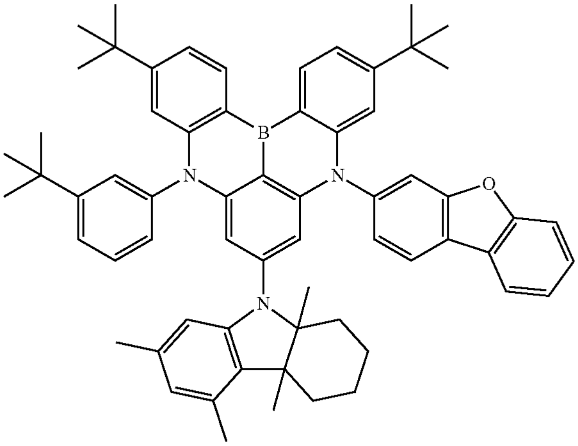
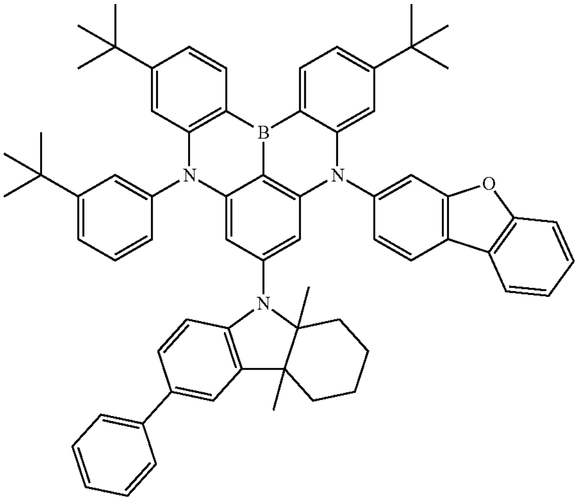

-continued
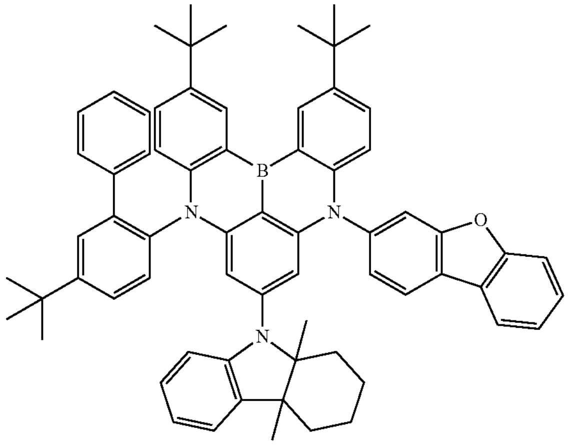
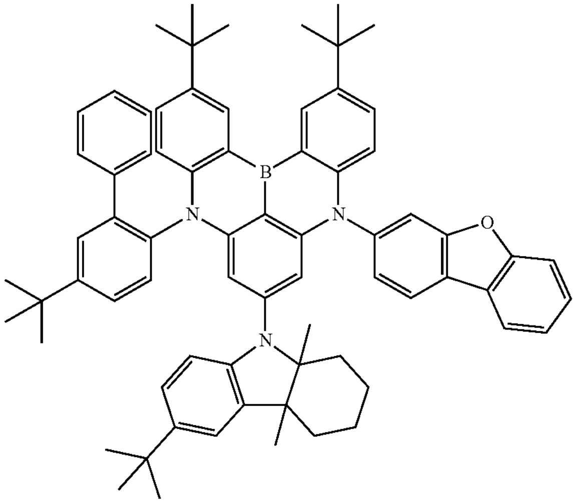
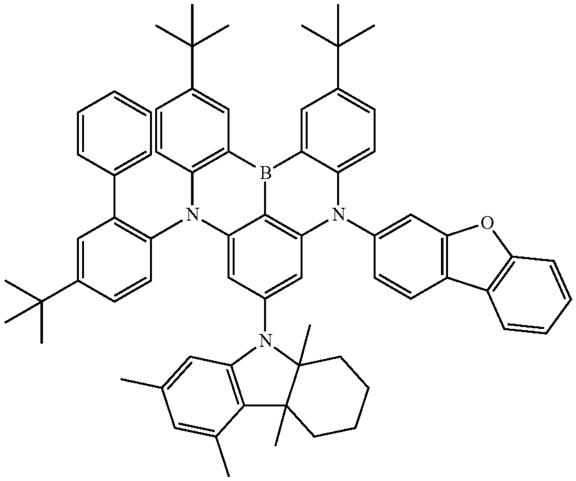
-continued
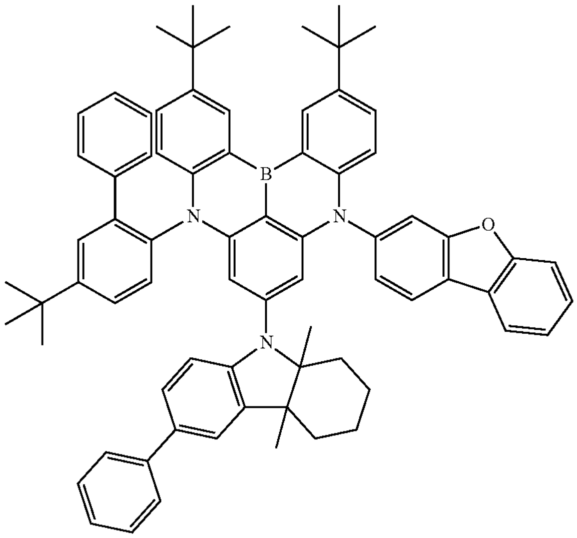
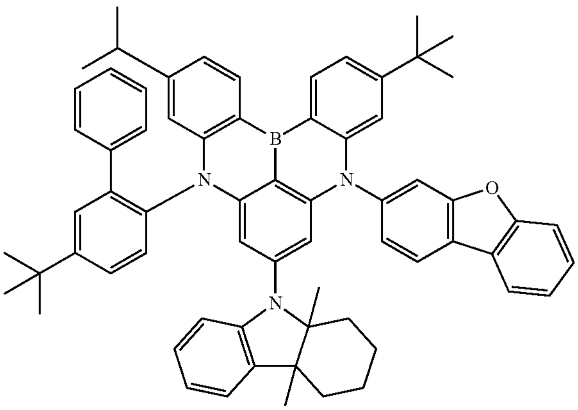
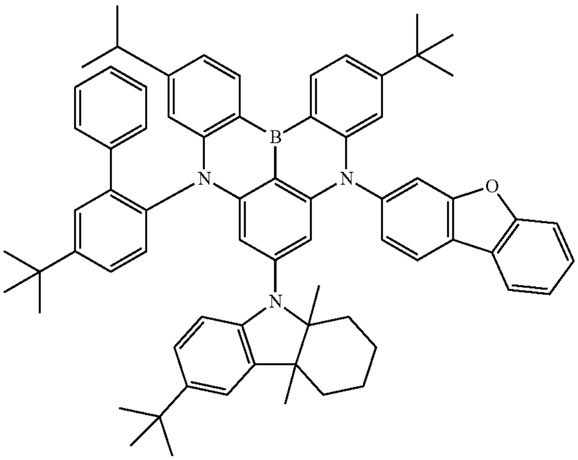

-continued
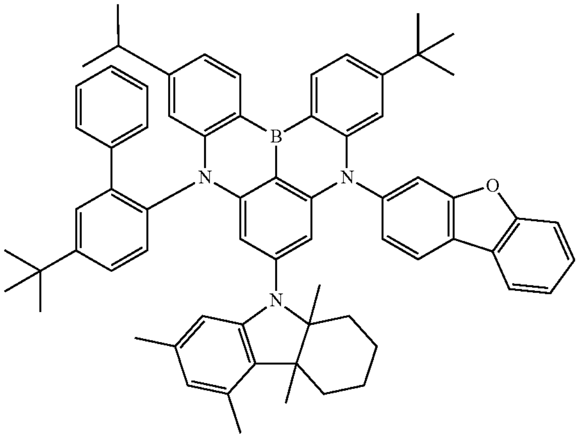
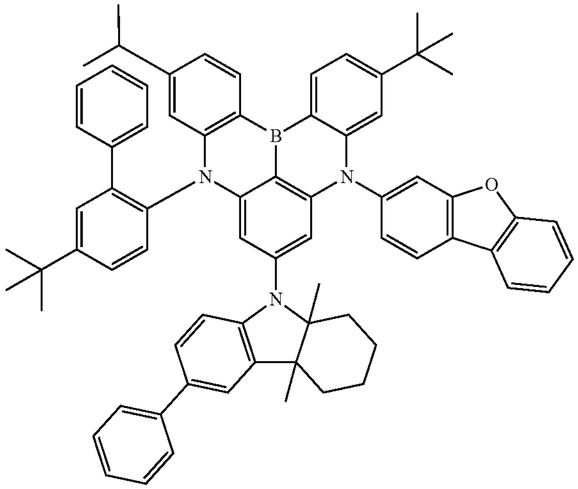
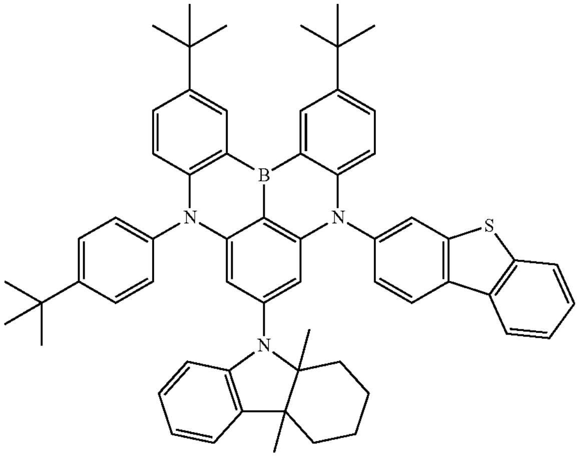
-continued
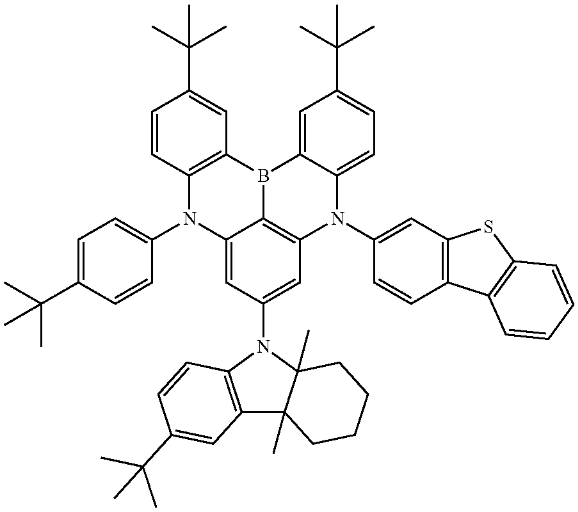
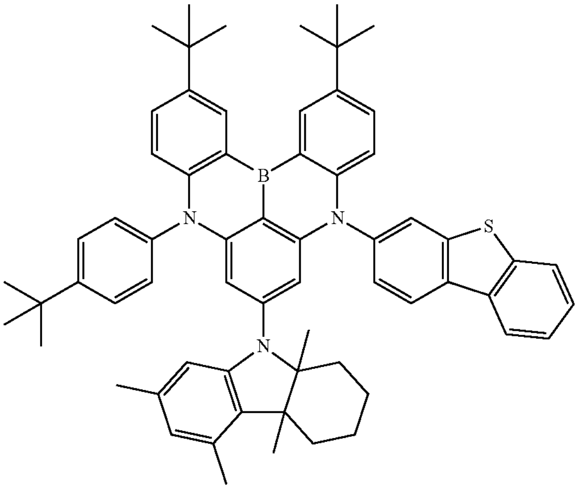
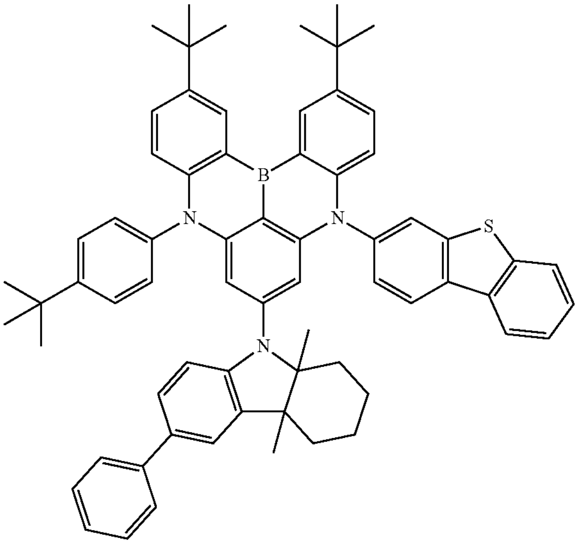

-continued
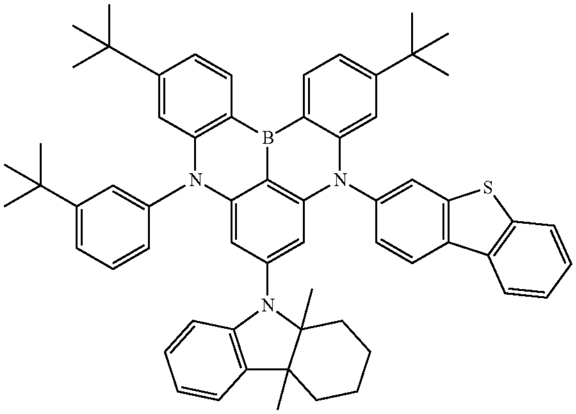
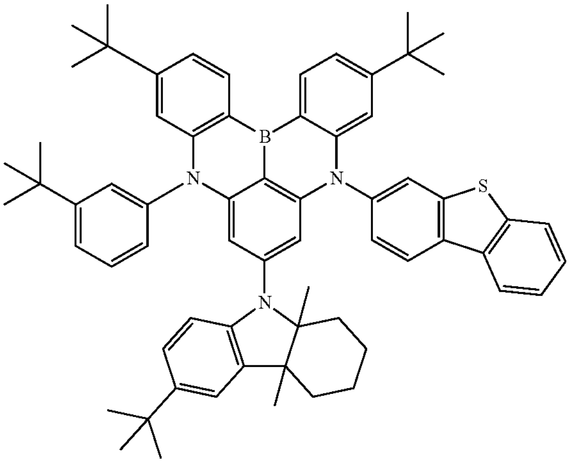
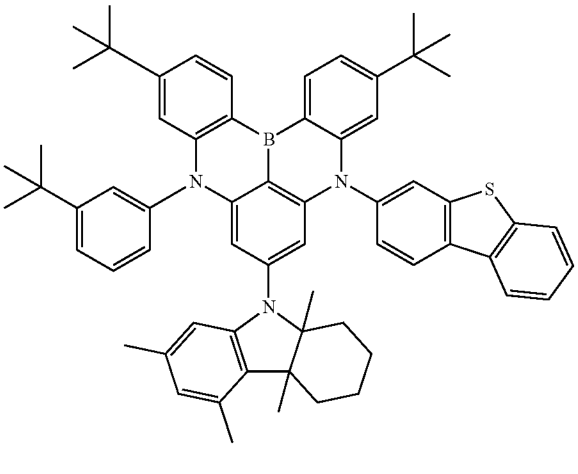
-continued
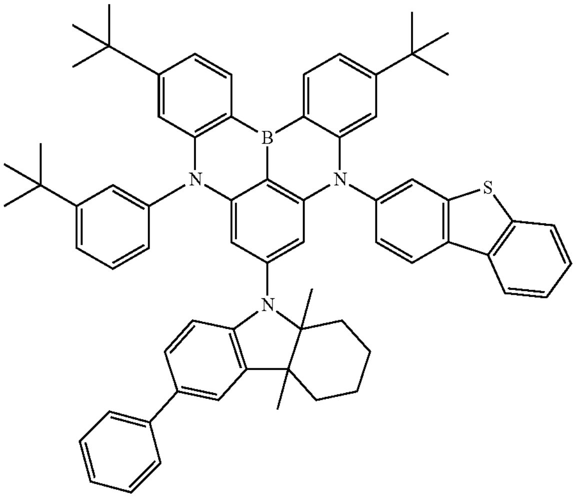
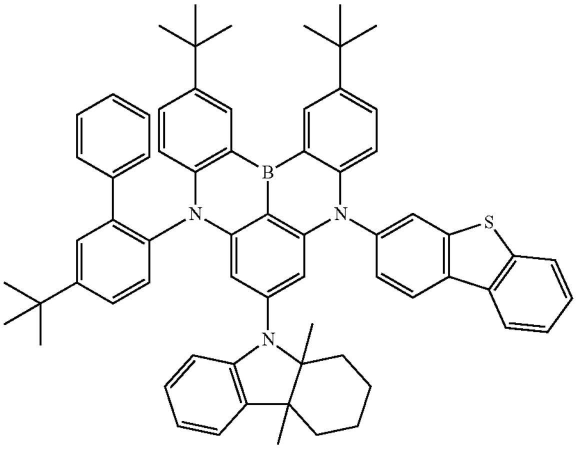
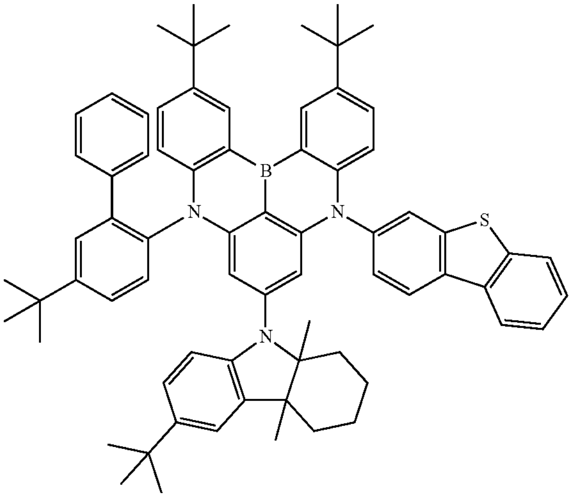

-continued
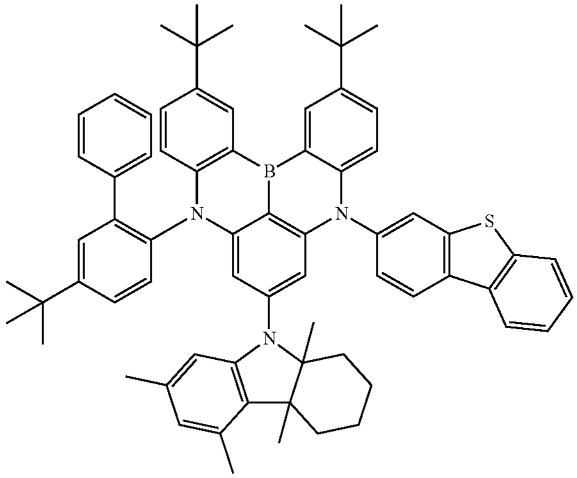
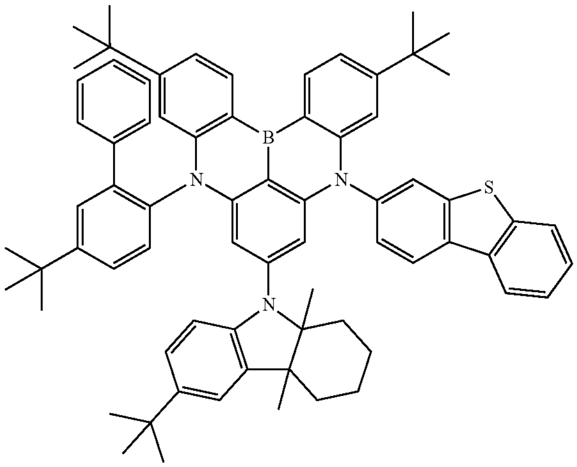
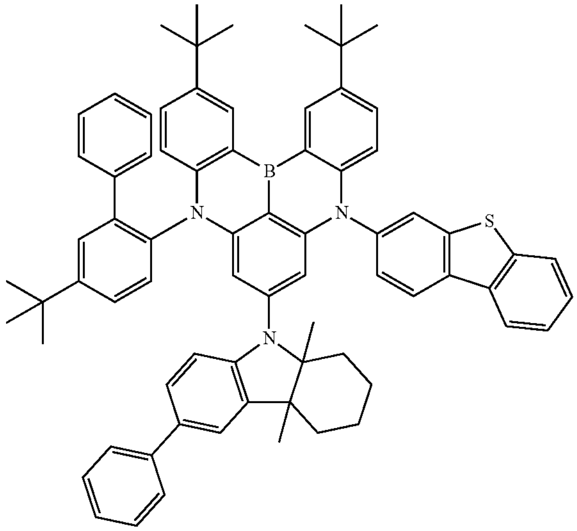 [SMILES: CC(C)(C)c1ccc2c(c1)B1c3cc(C(C)(C)C)ccc3N(c3ccc(C(C)(C)C)cc3-c3ccccc3)c3cc(N4c5ccc(-c6ccccc6)cc5C5(C)CCCCC45C)cc(c31)N2c1ccc2c(c1)sc1ccccc12]
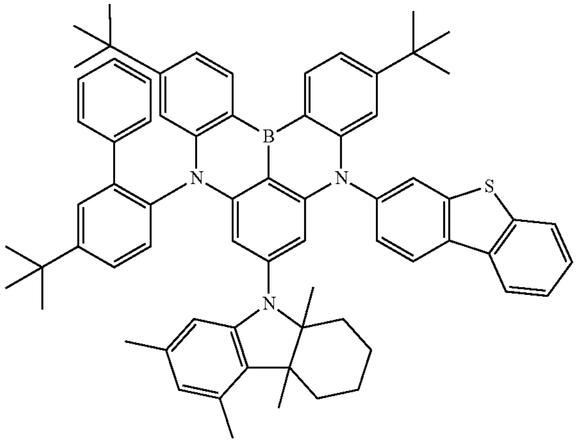
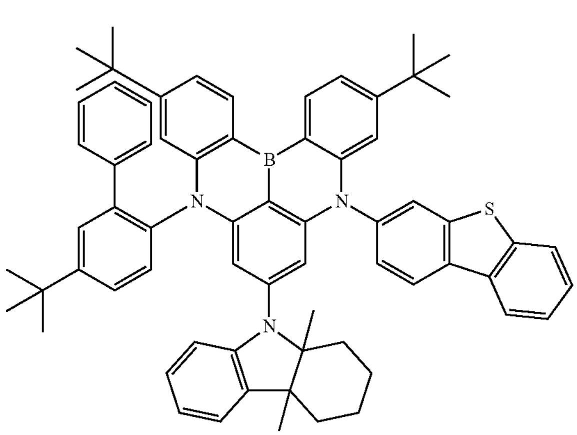
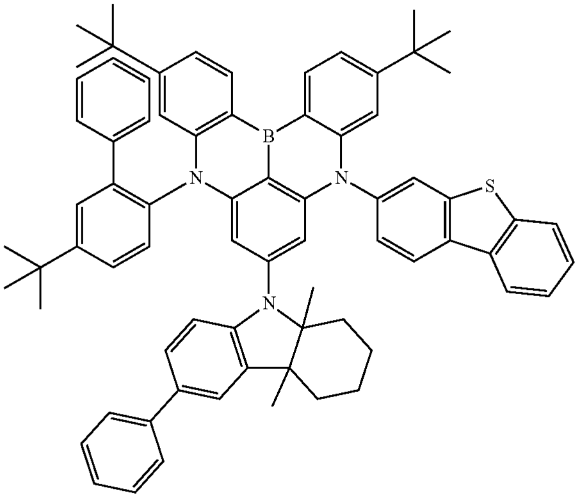
-continued -continued
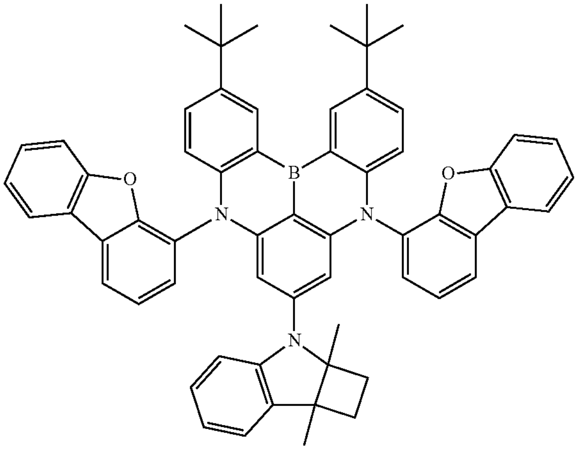
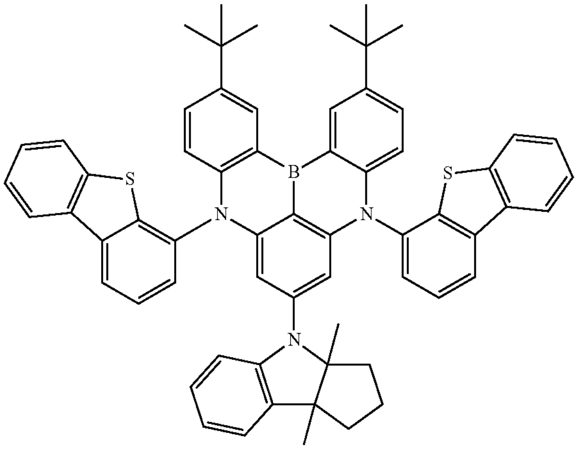
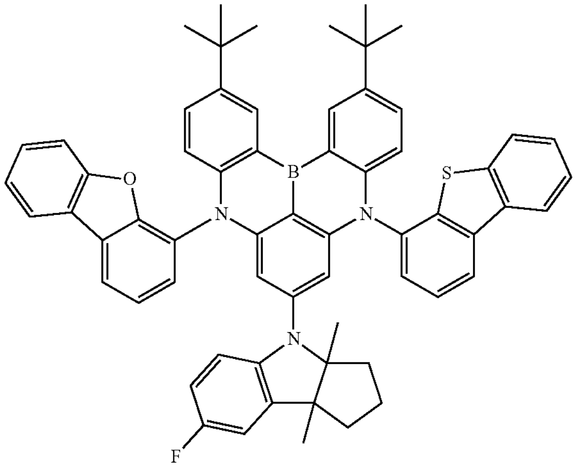
-continued
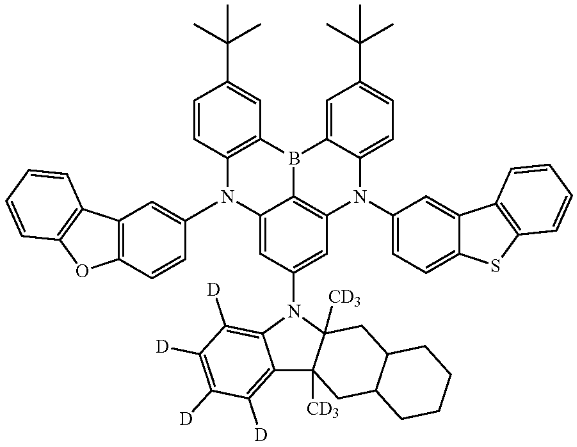
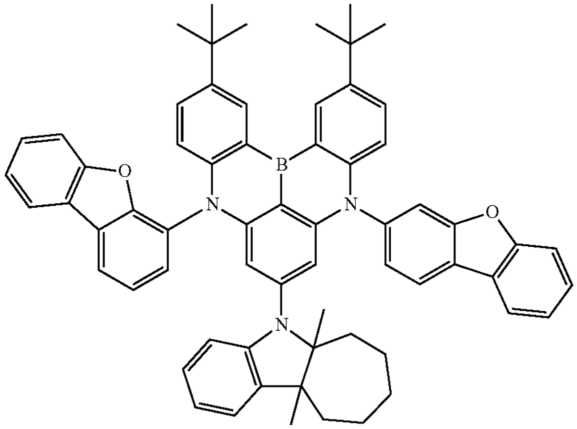
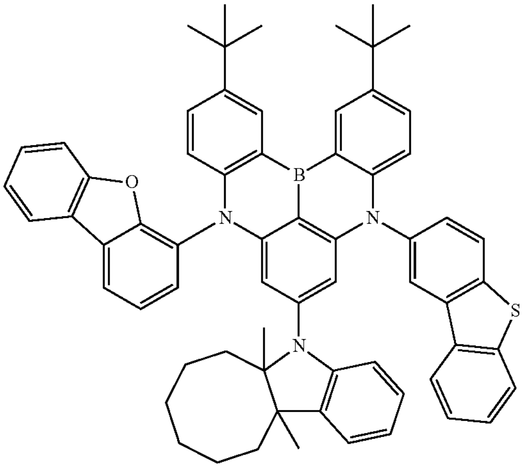

-continued
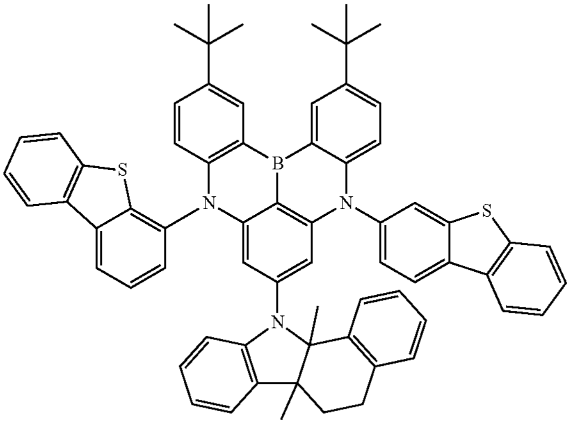
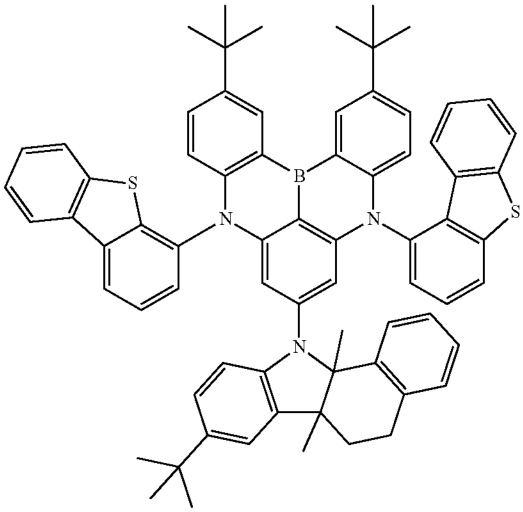
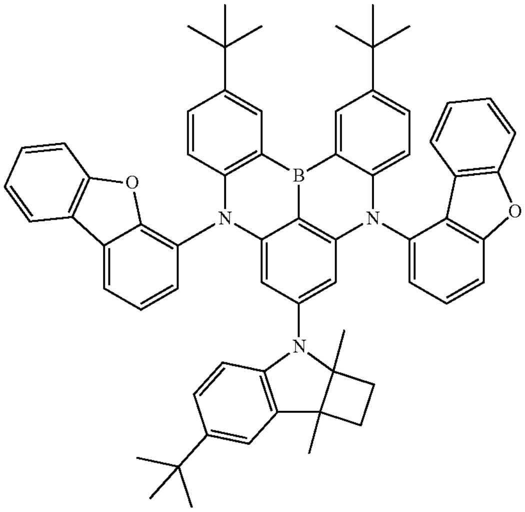
-continued
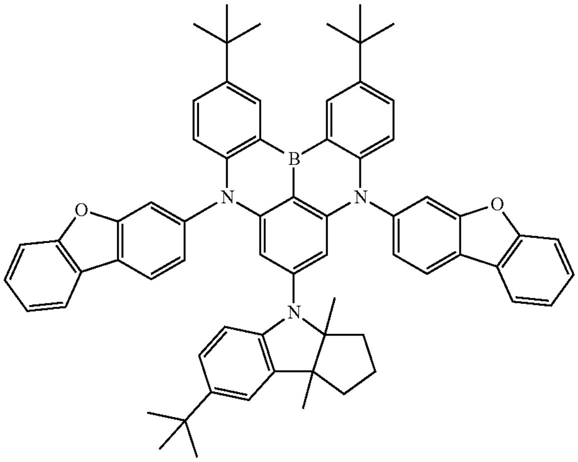
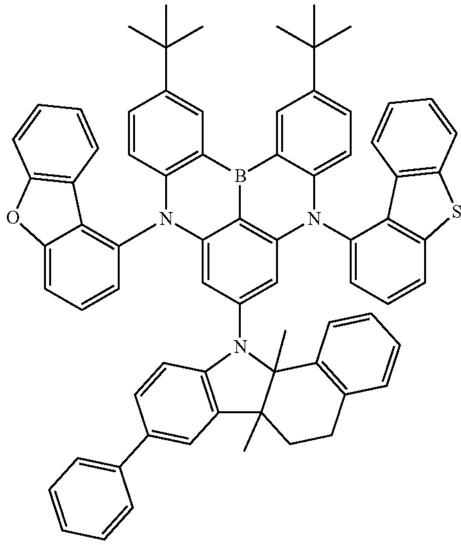
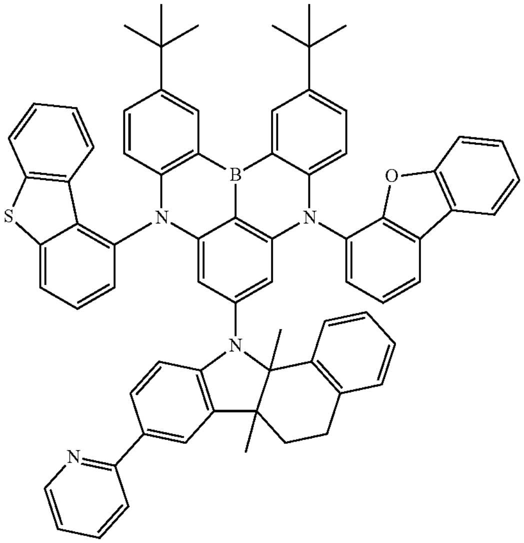

-continued
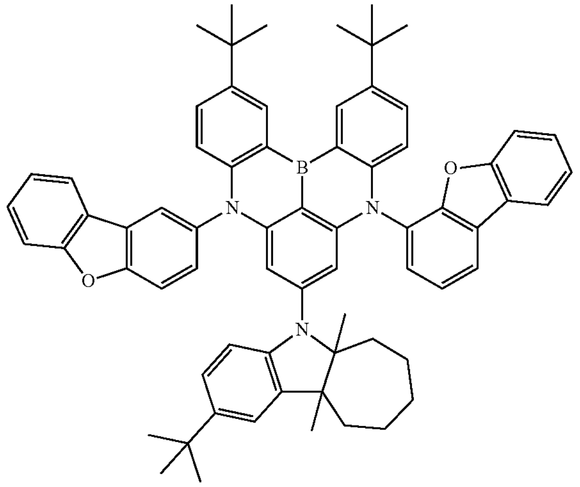
-continued
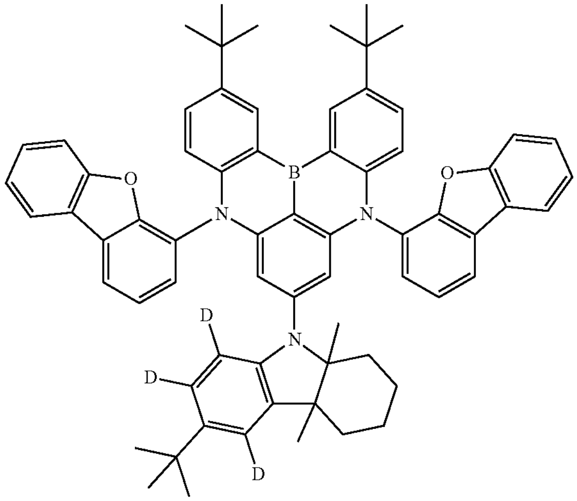
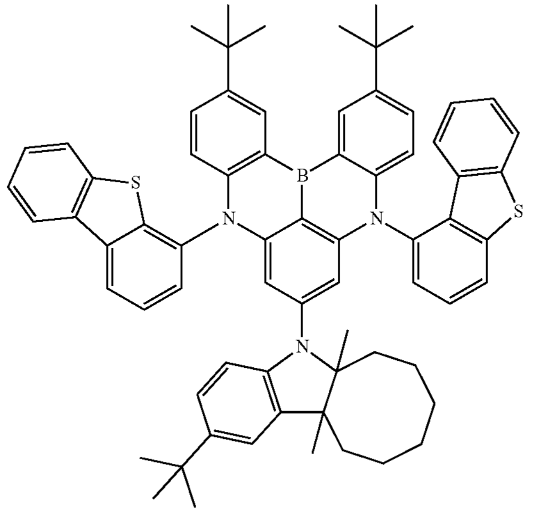
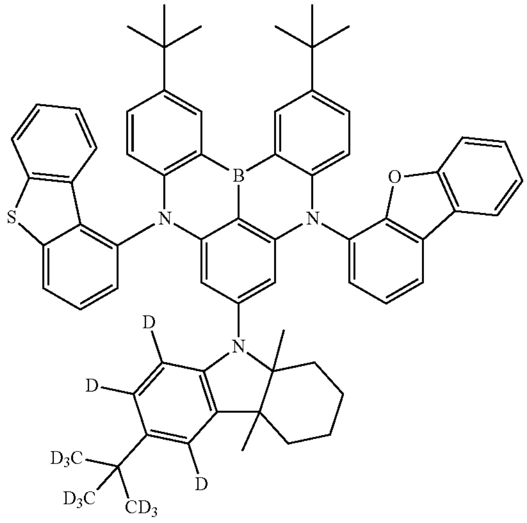
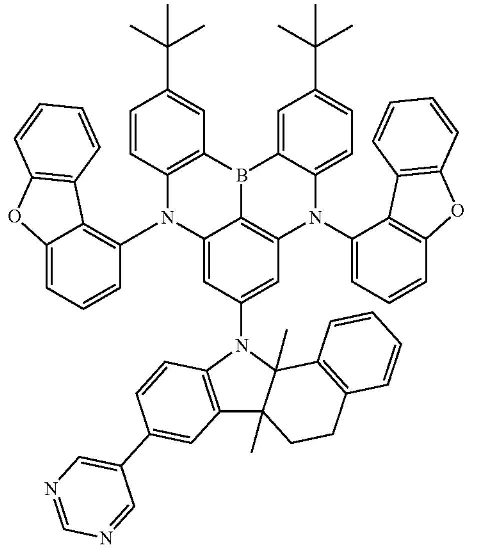
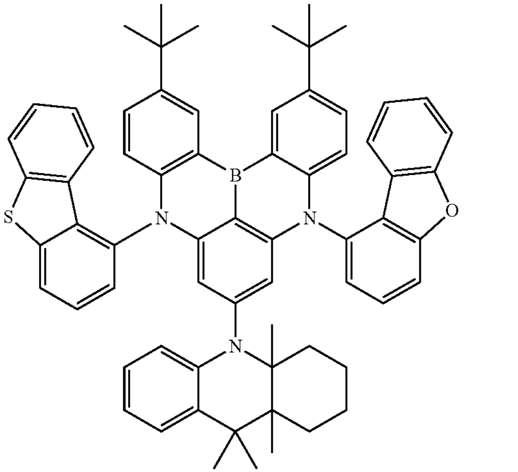

-continued
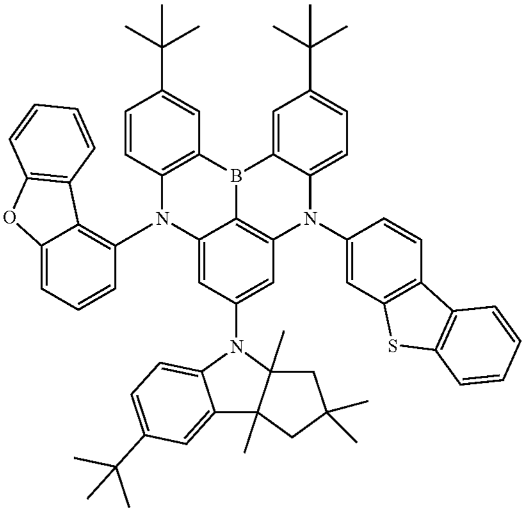
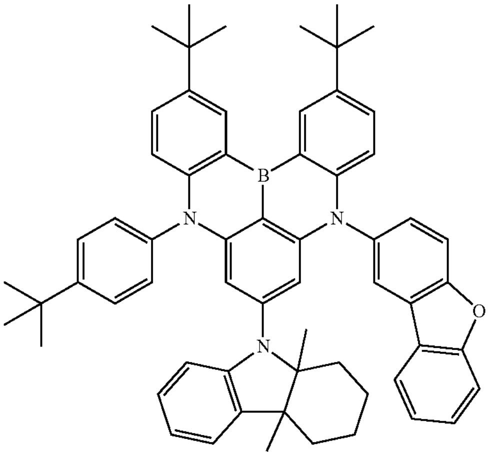
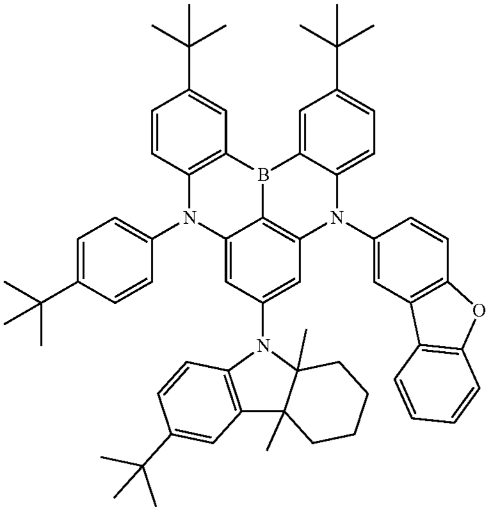
-continued
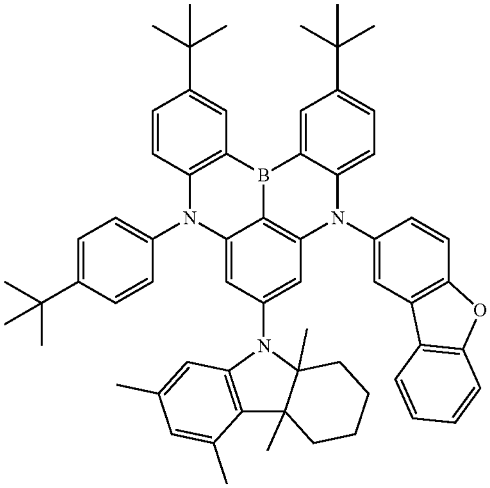
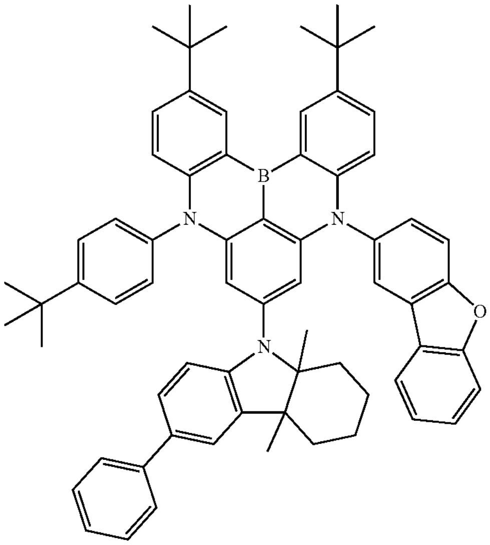
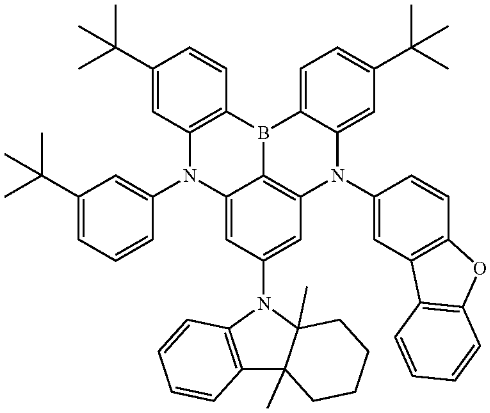

-continued
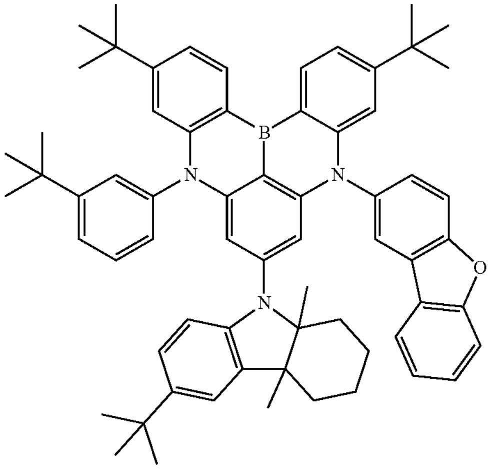
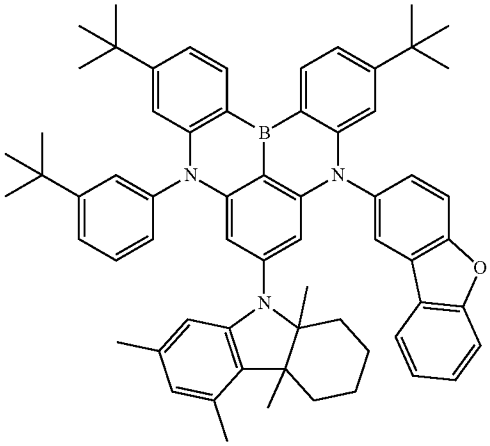
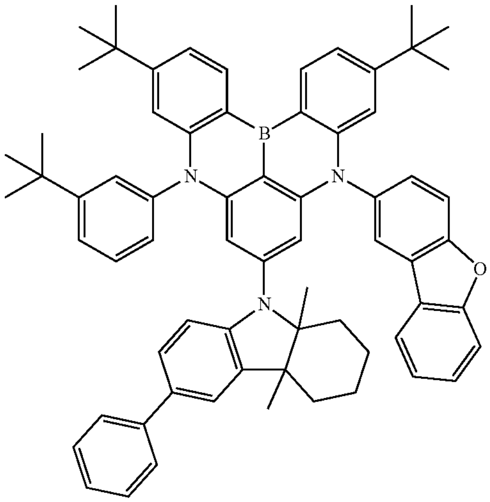
-continued
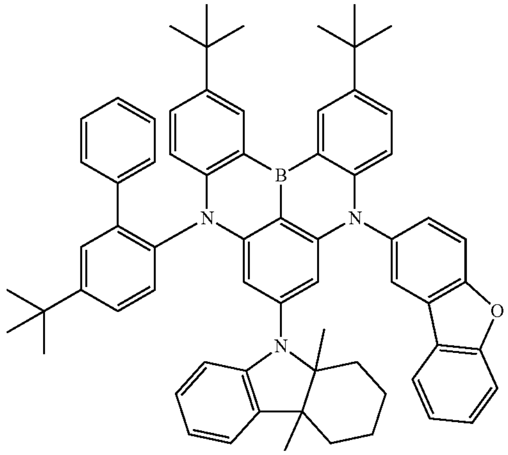
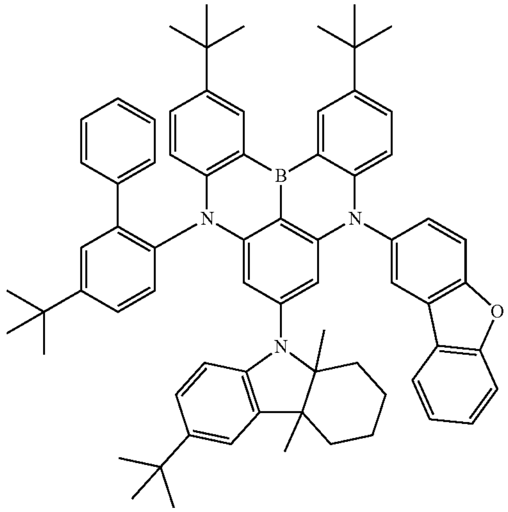
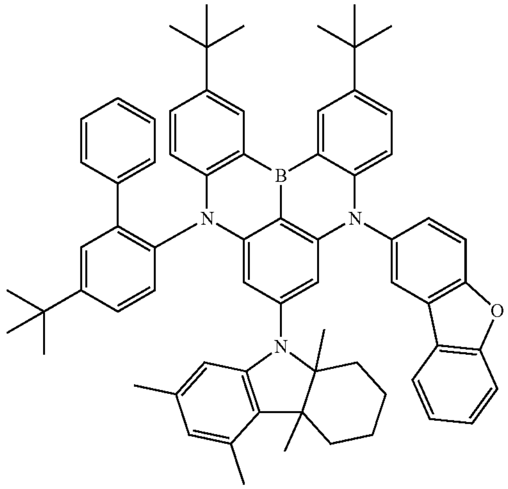

-continued
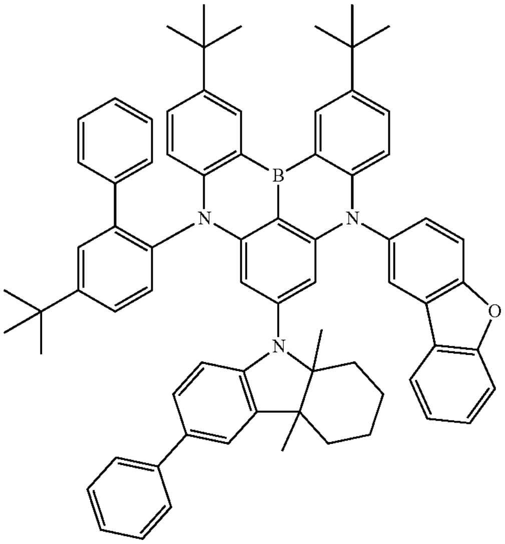
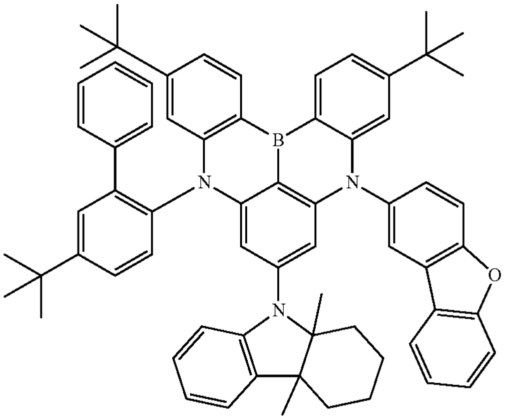
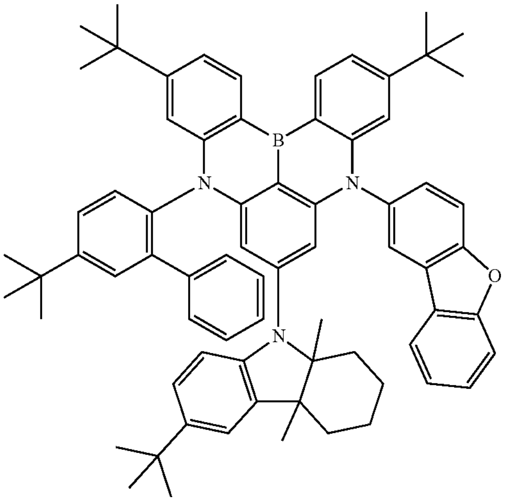
-continued
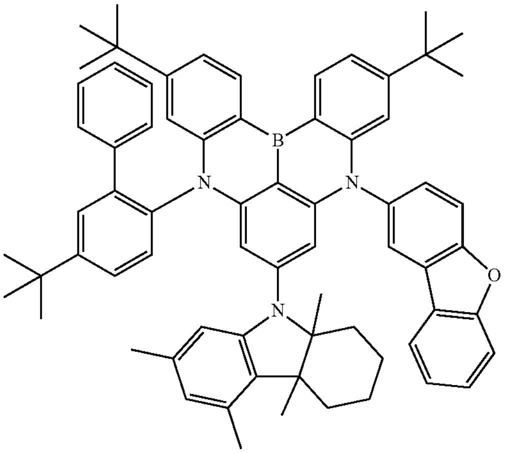
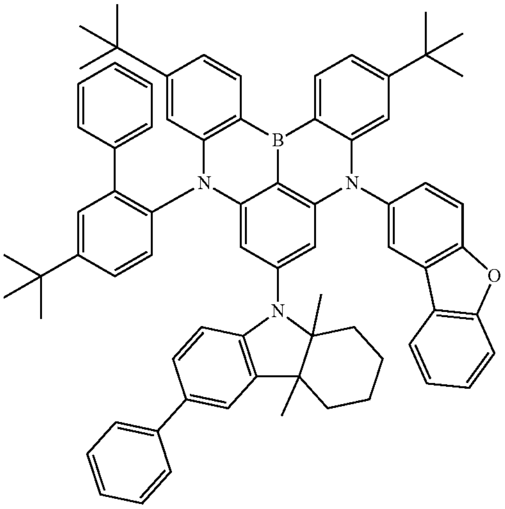
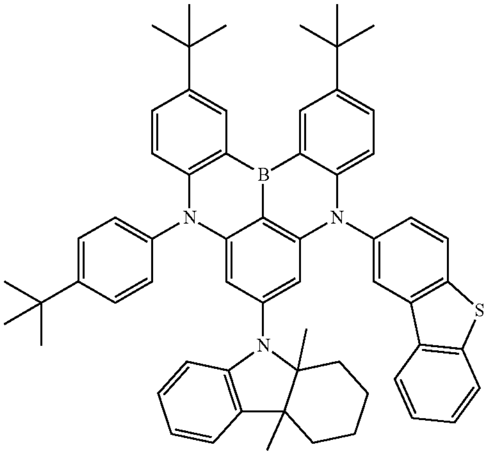

-continued
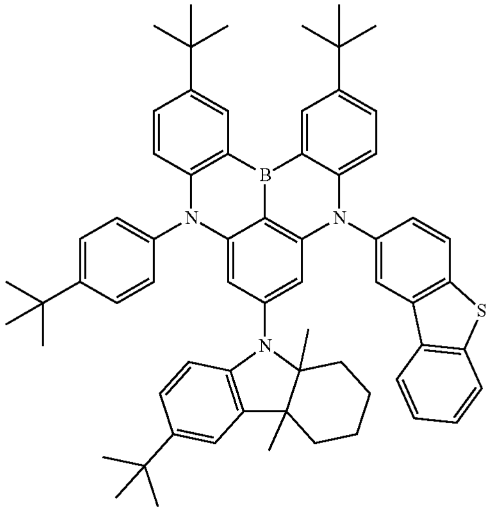
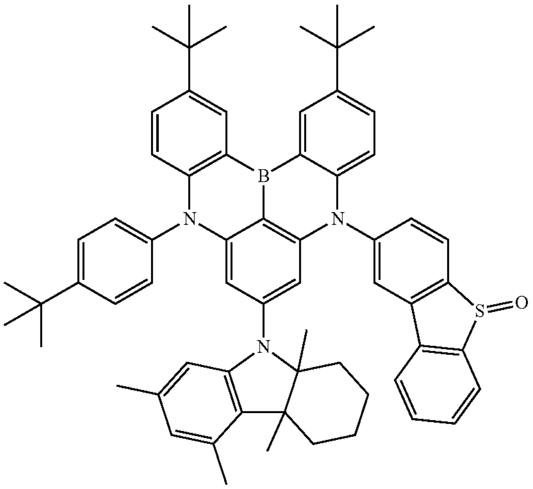
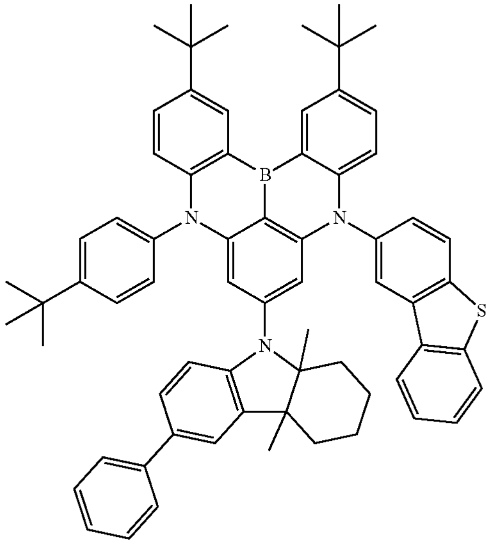
-continued
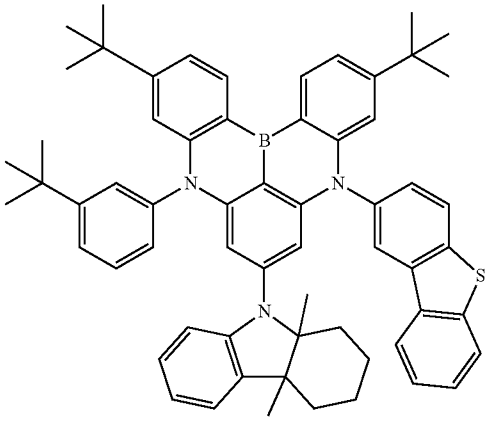
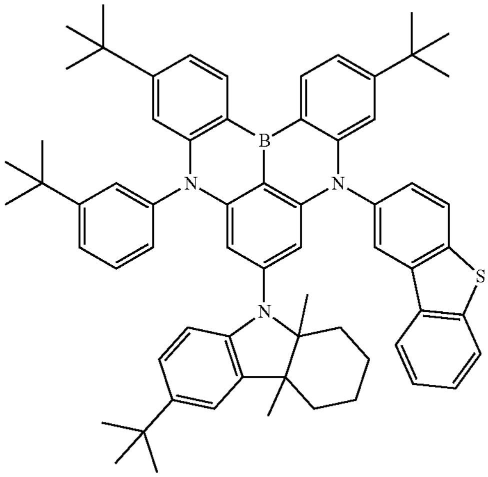
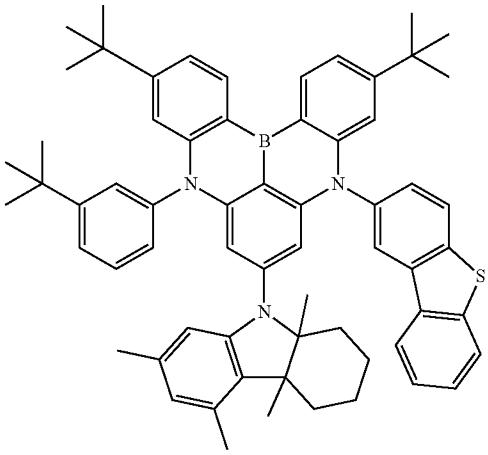

-continued
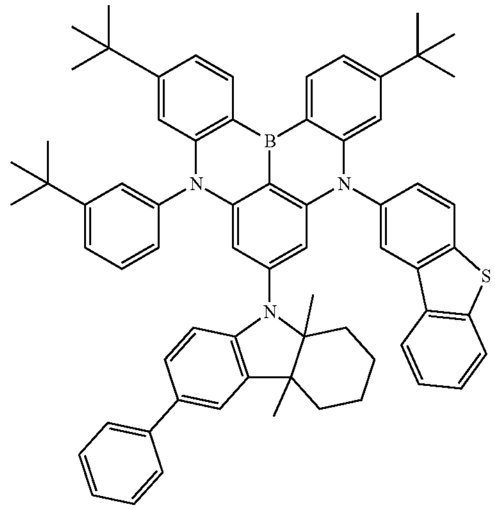
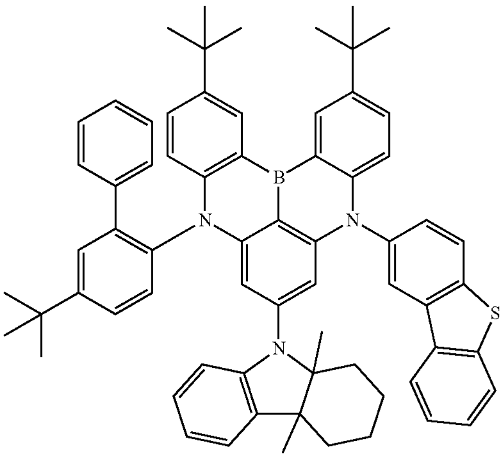
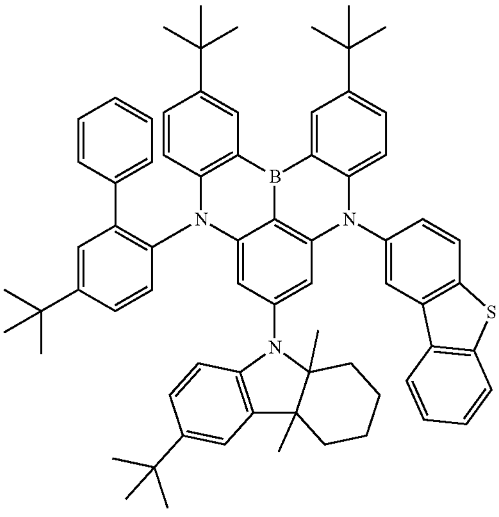
-continued
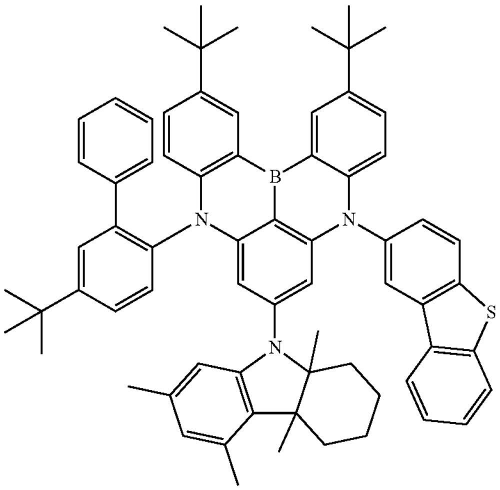
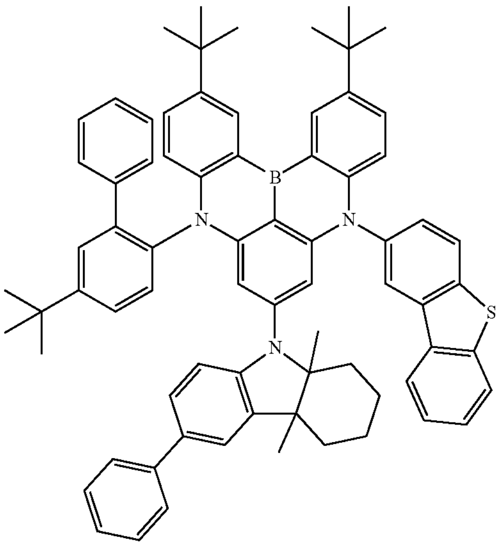
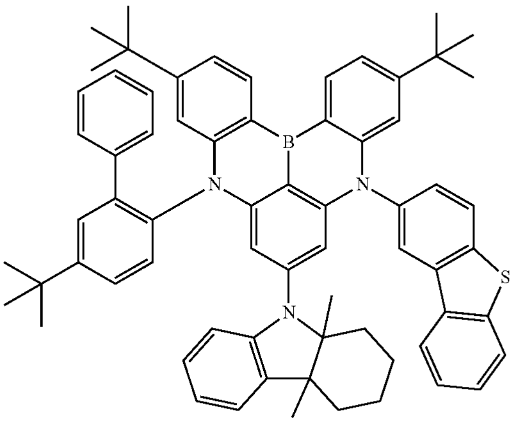

-continued
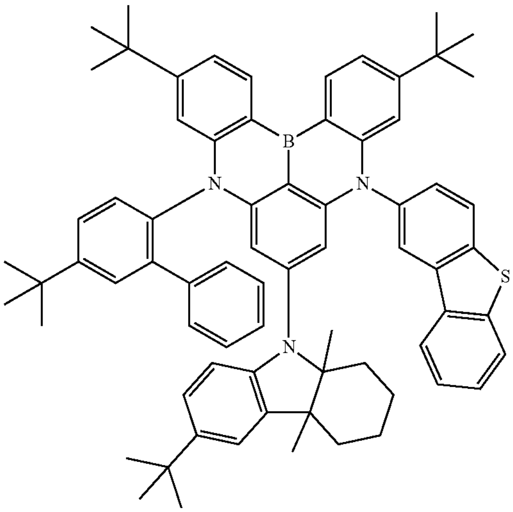
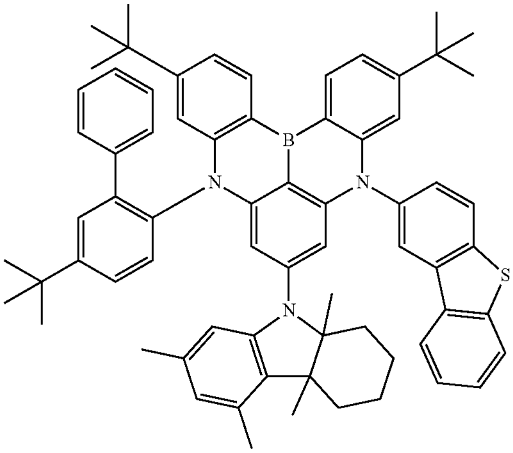
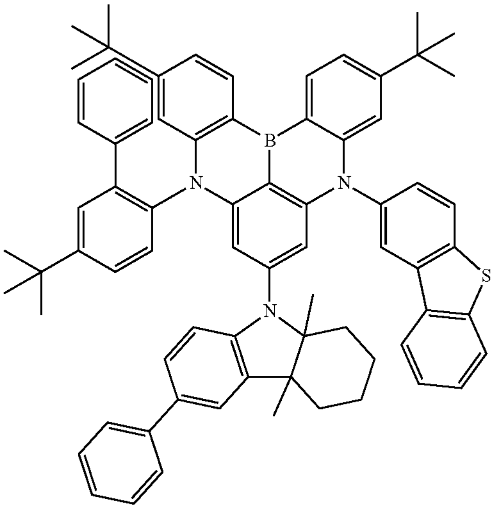
-continued
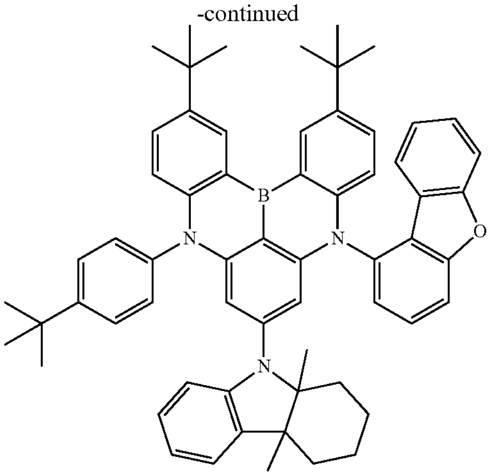
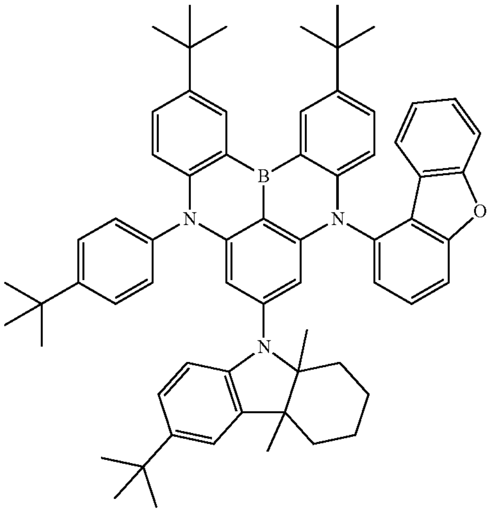
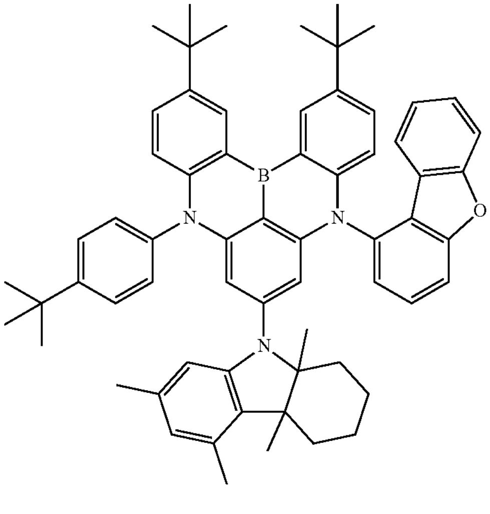

-continued
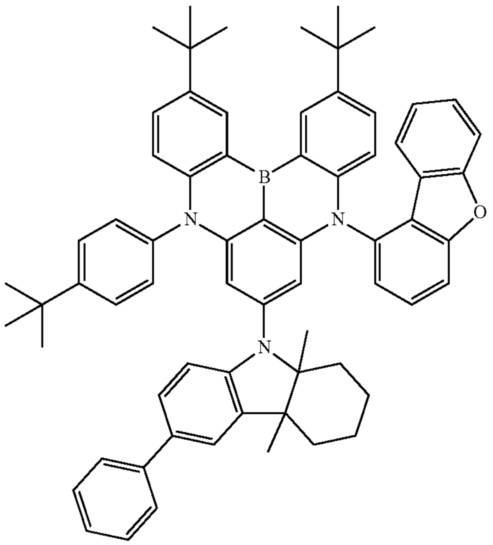
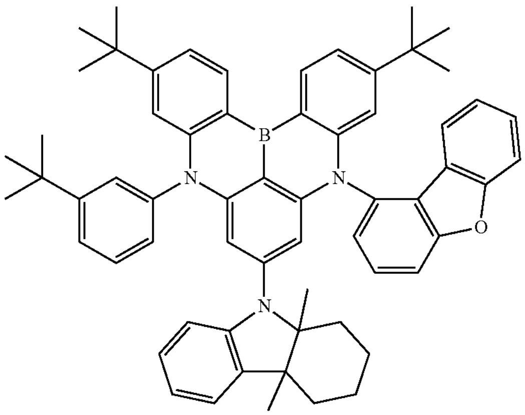
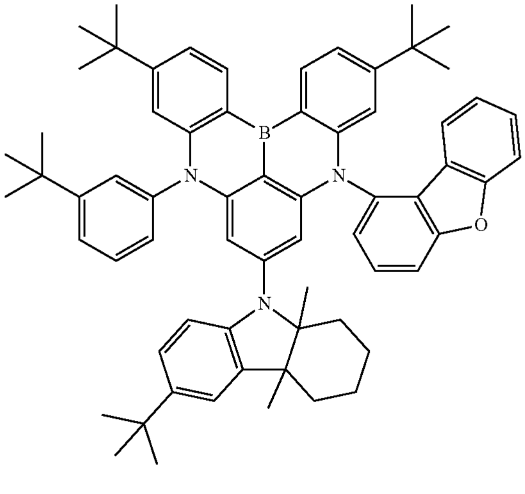
-continued
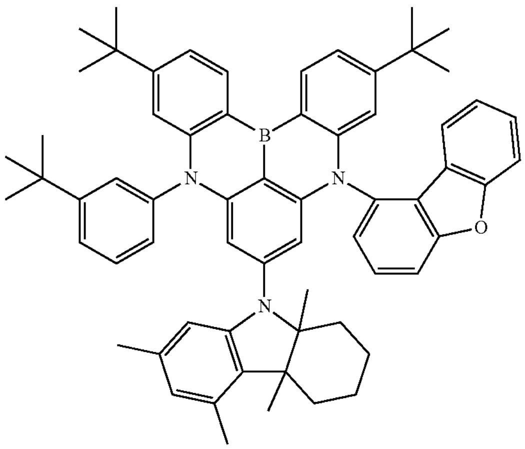
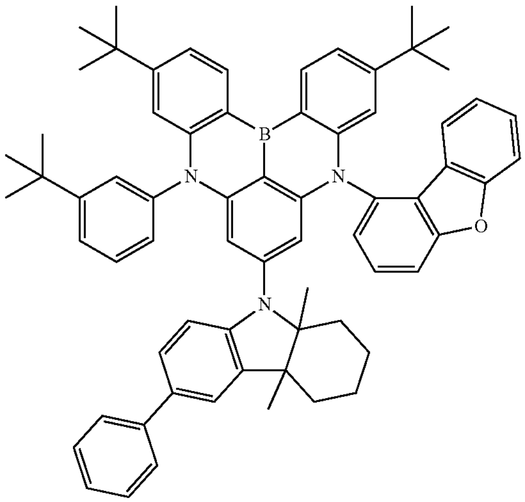
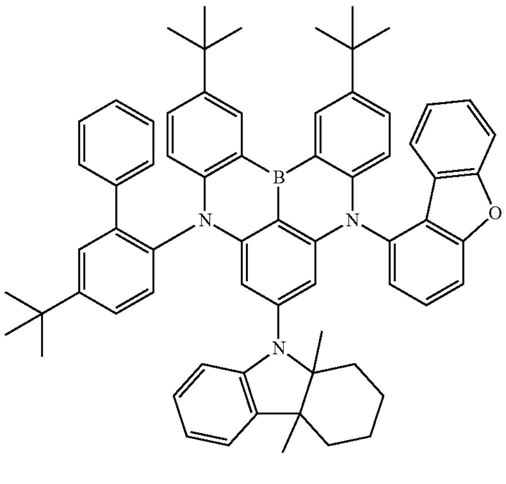

-continued
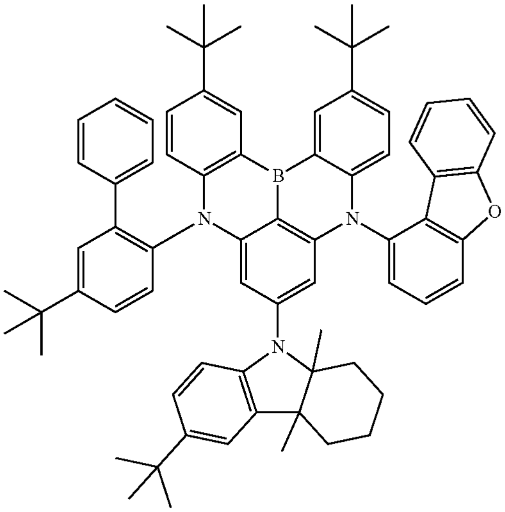
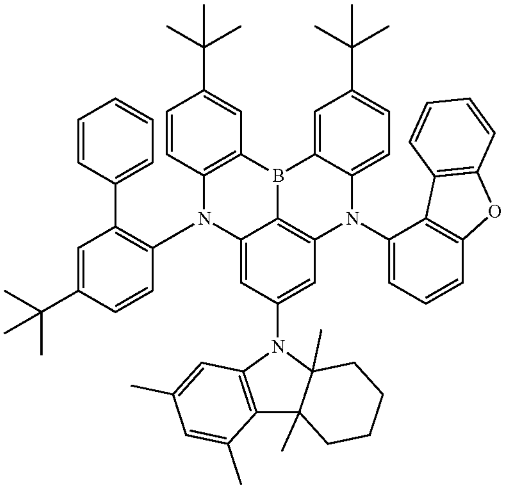
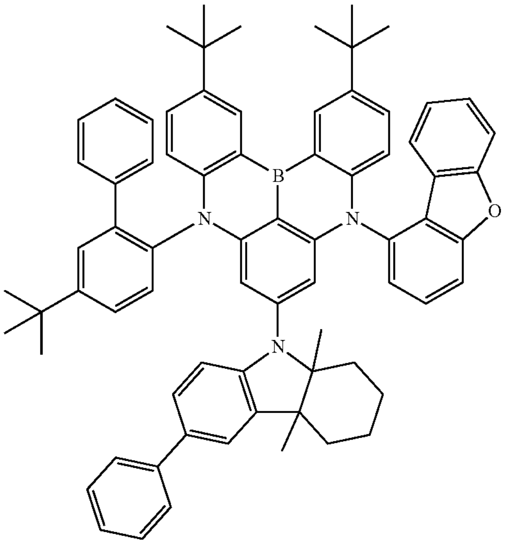
-continued
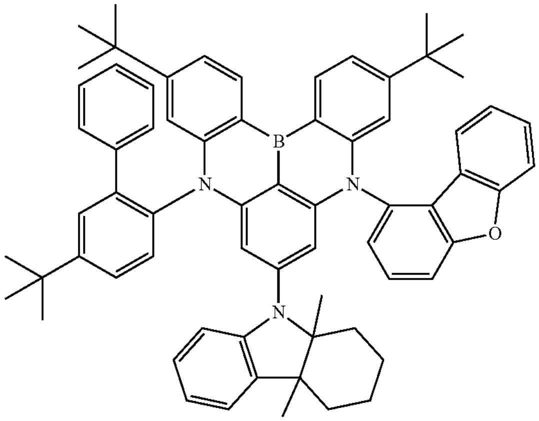
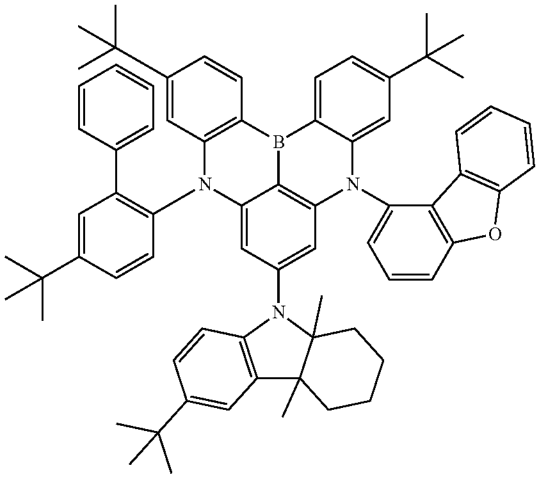
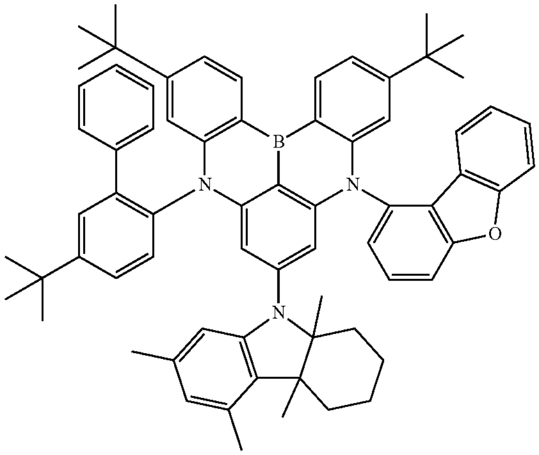

-continued
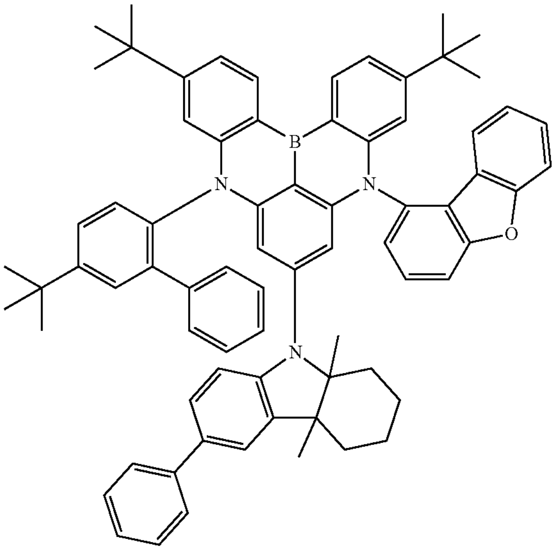
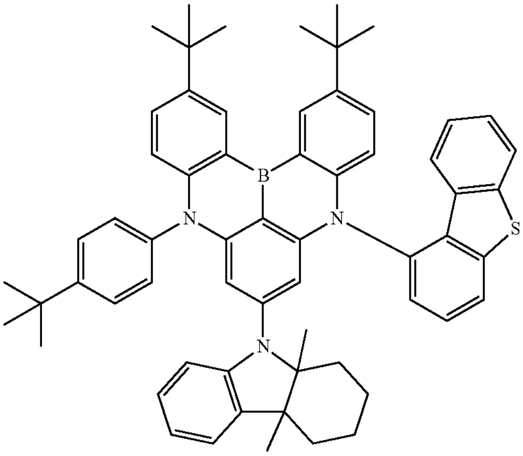
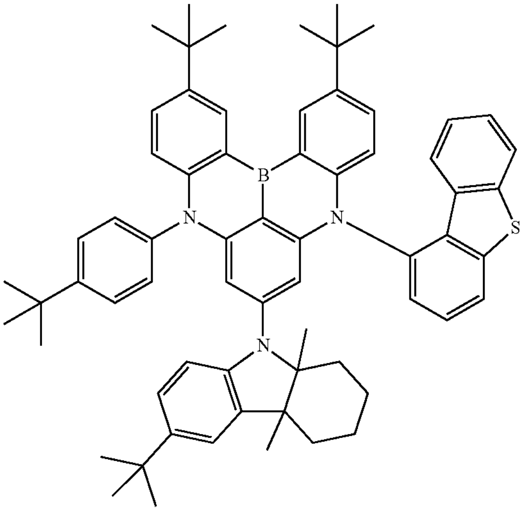
-continued
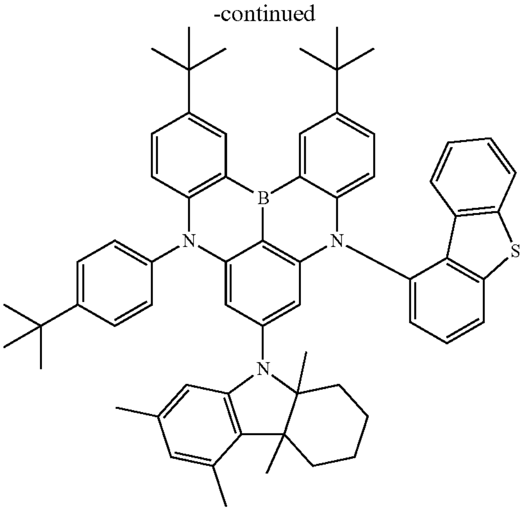
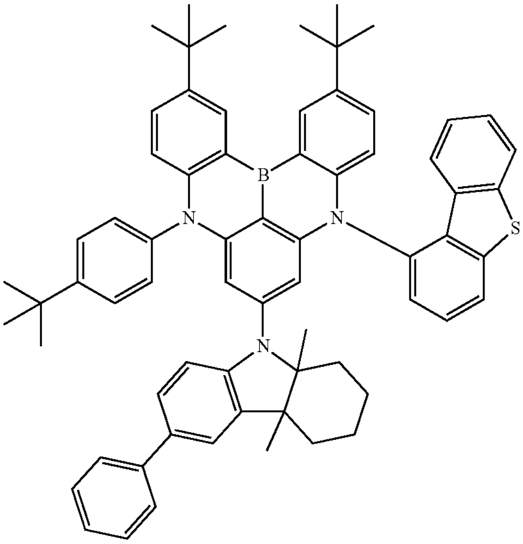
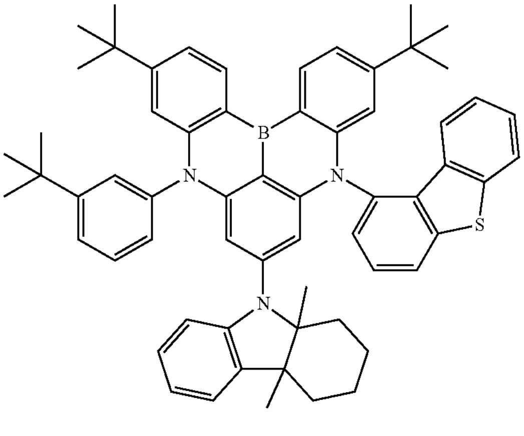

-continued
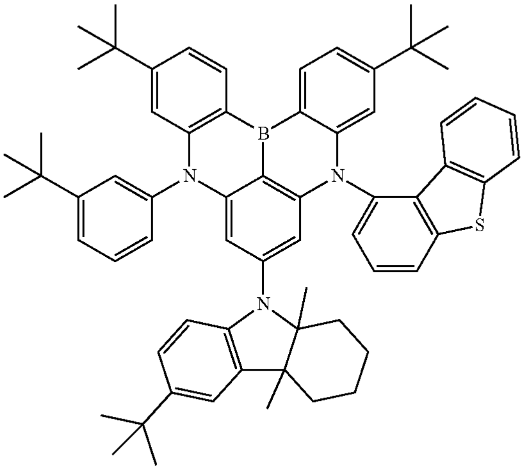
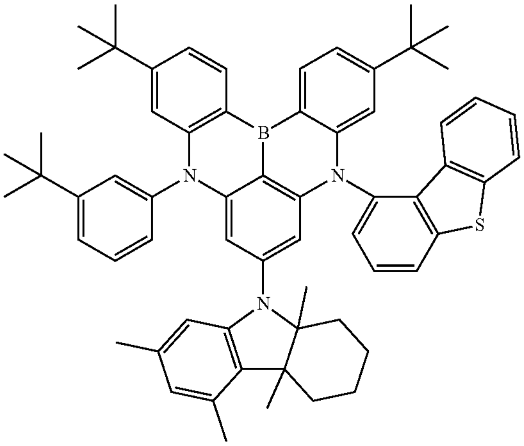
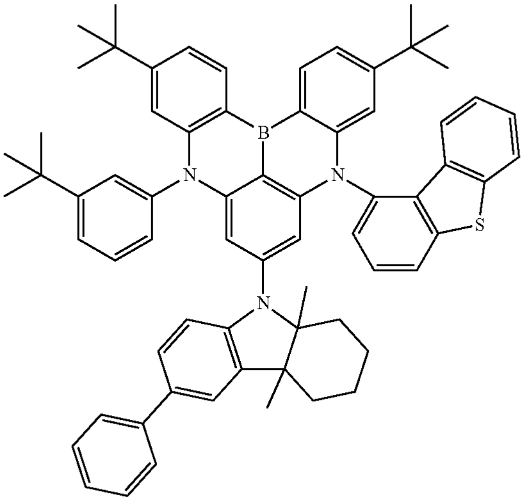
-continued
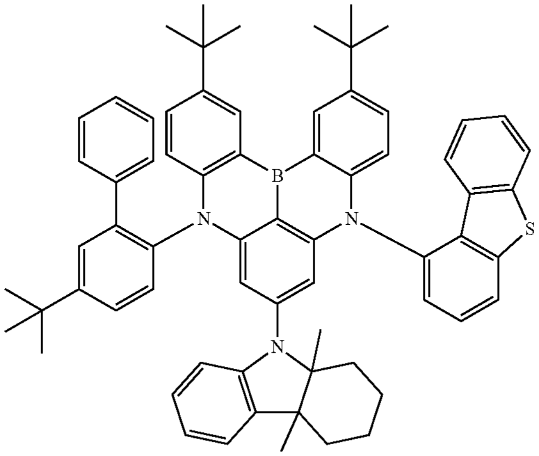
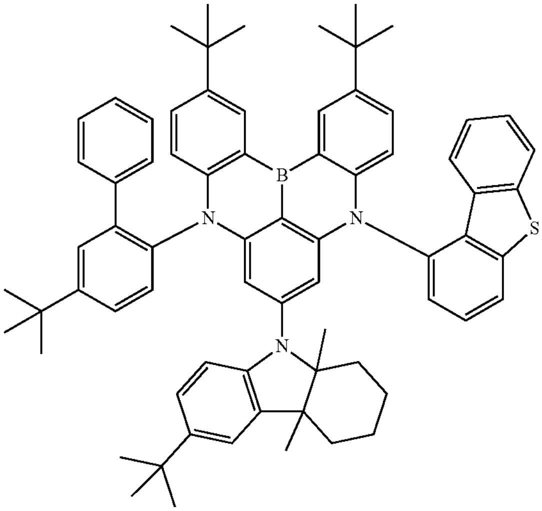
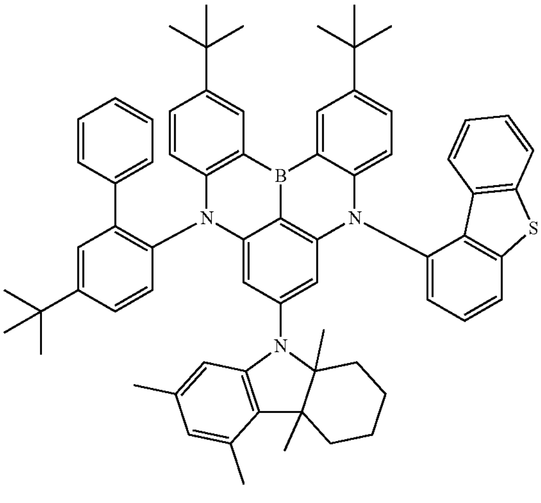

-continued
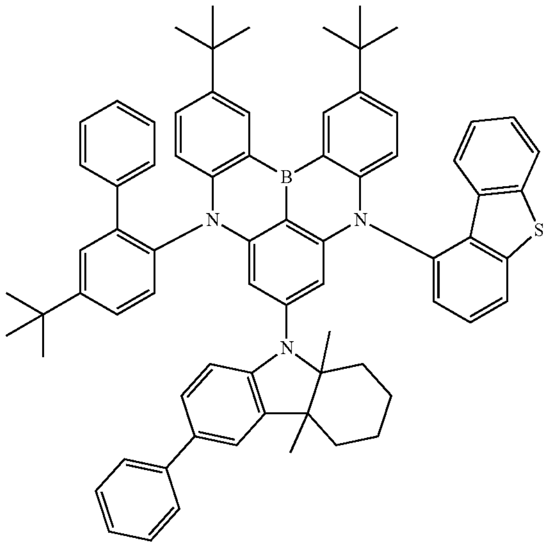
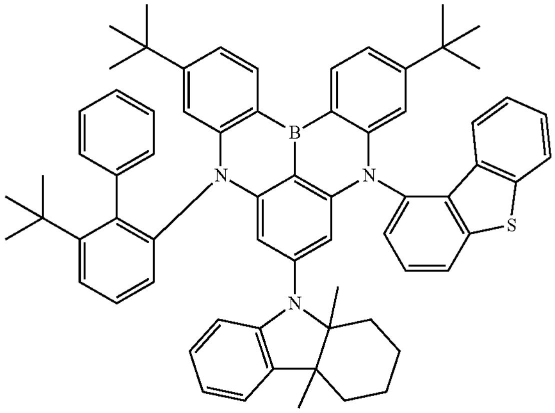
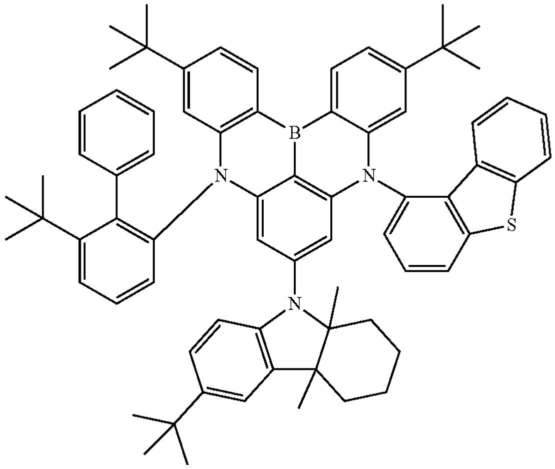
-continued
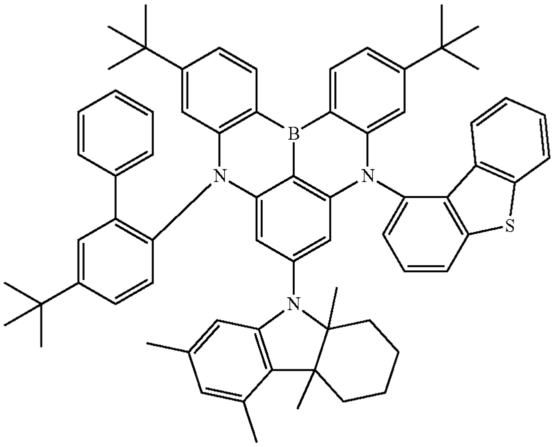
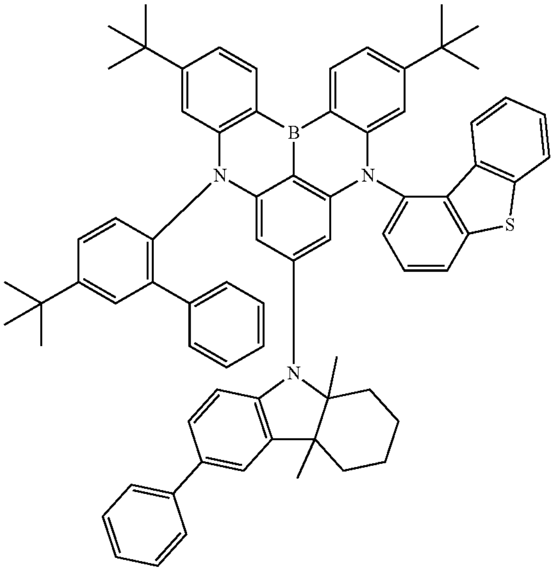
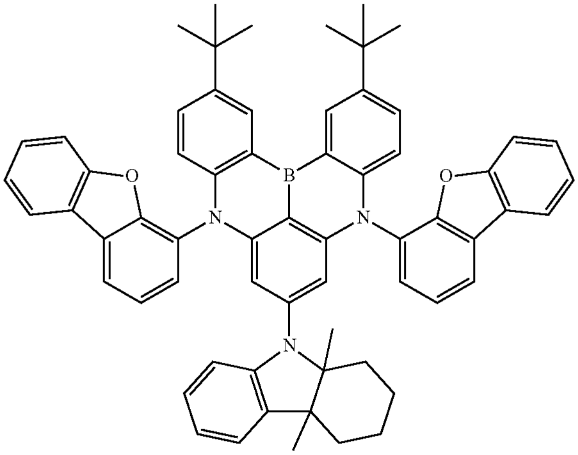

-continued
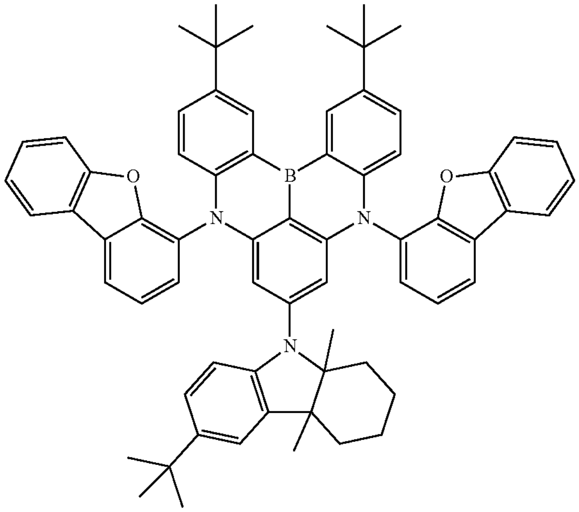
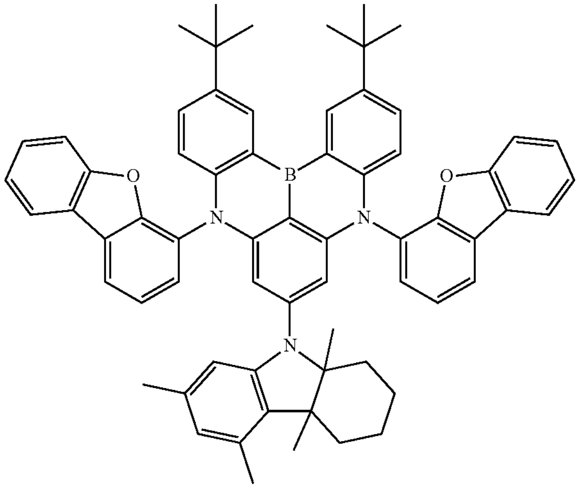
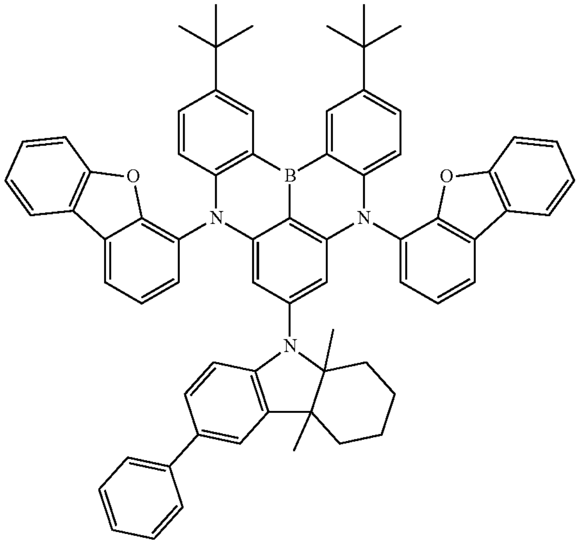
-continued
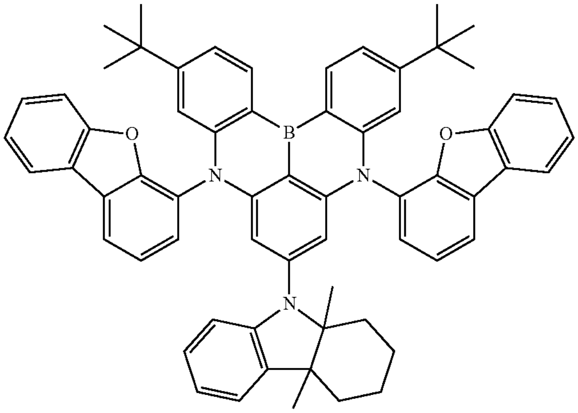
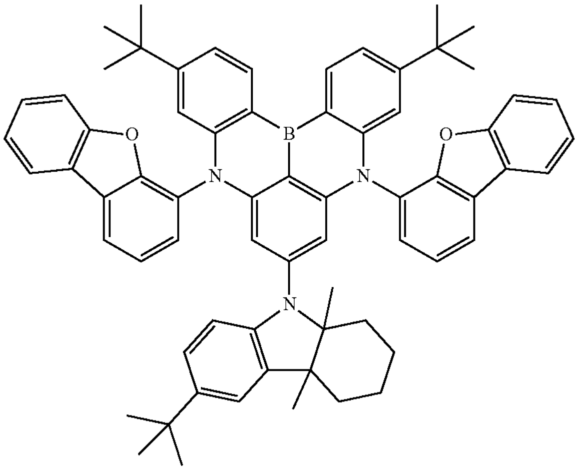
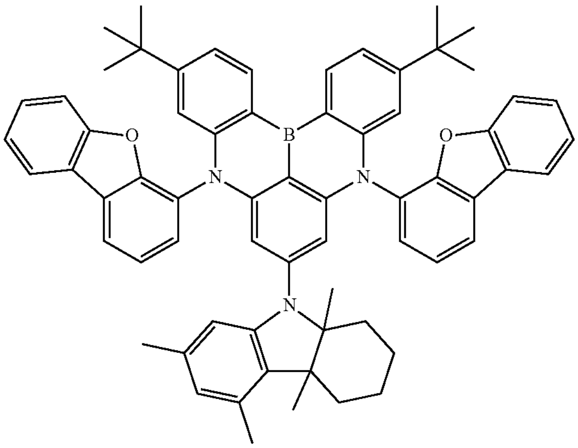

-continued
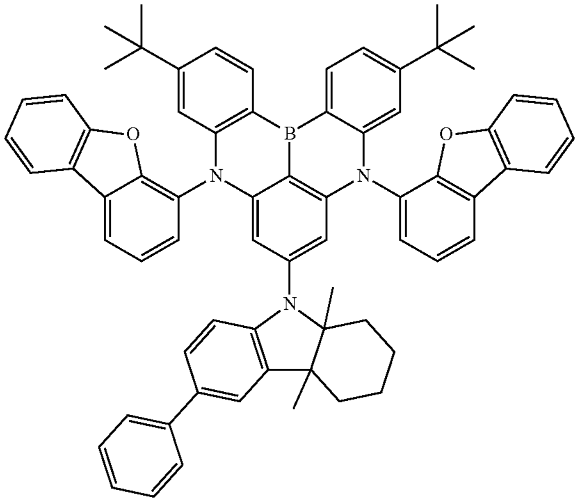
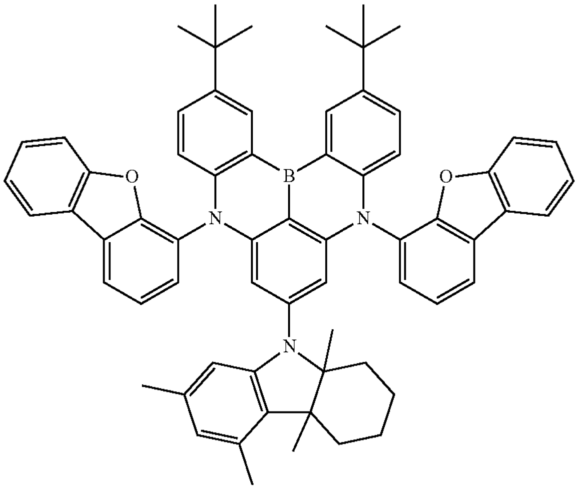
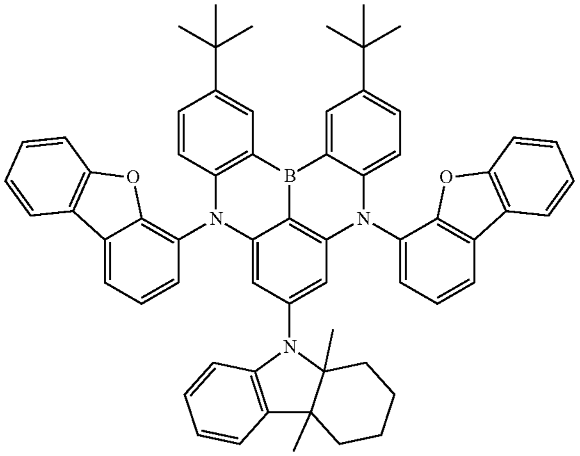
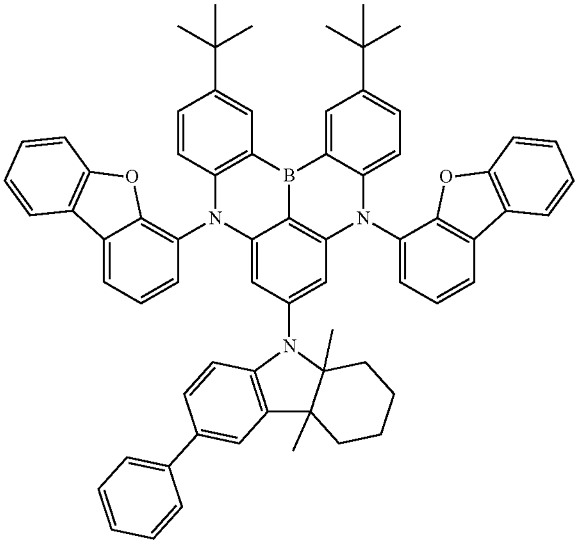
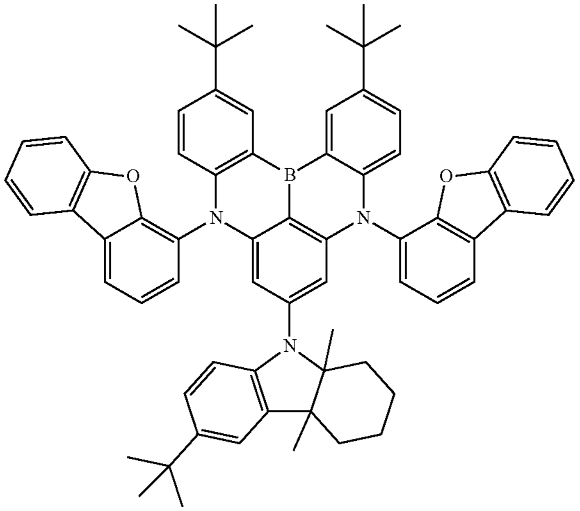
-continued
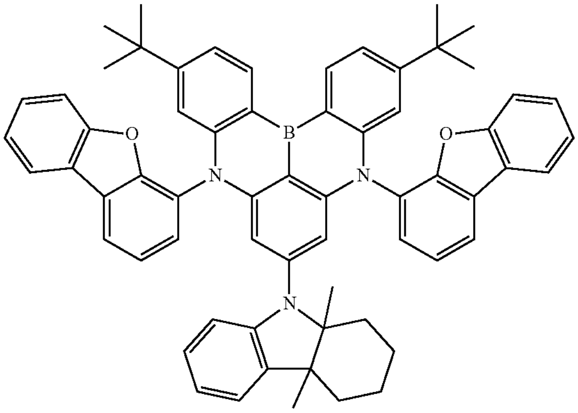

-continued
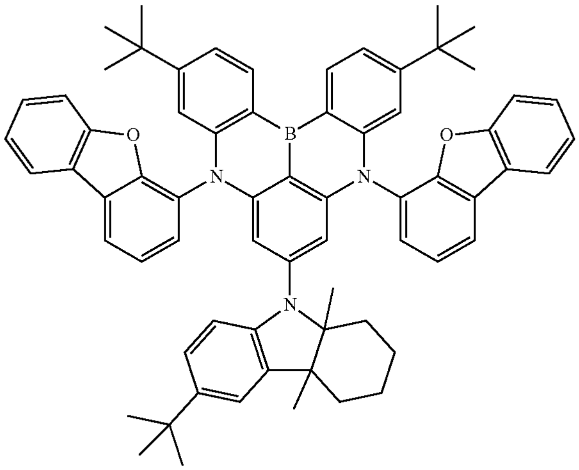
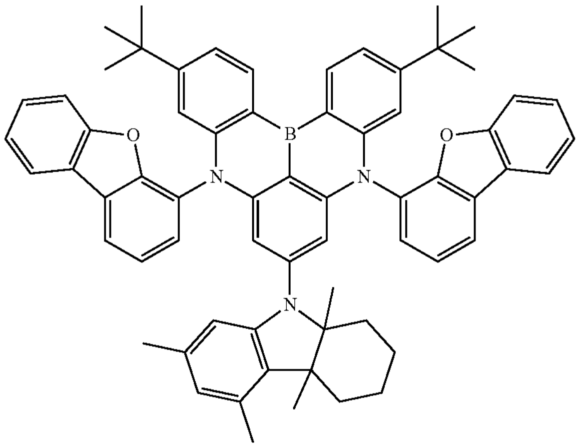
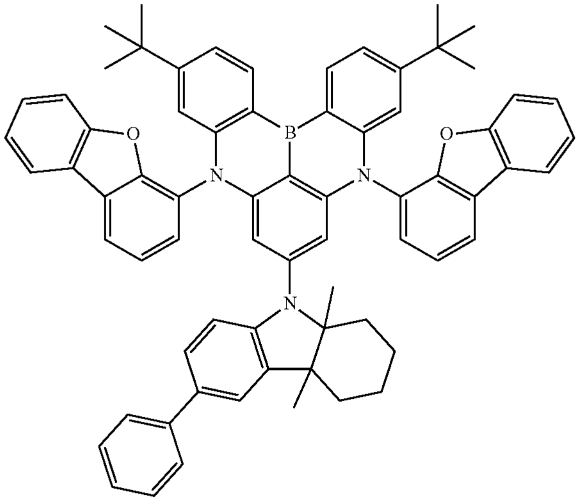
-continued
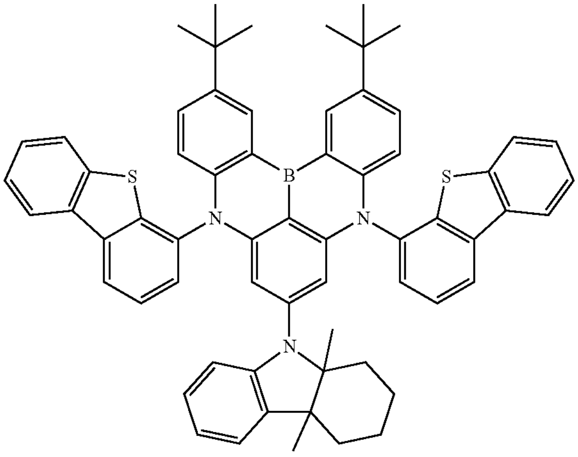
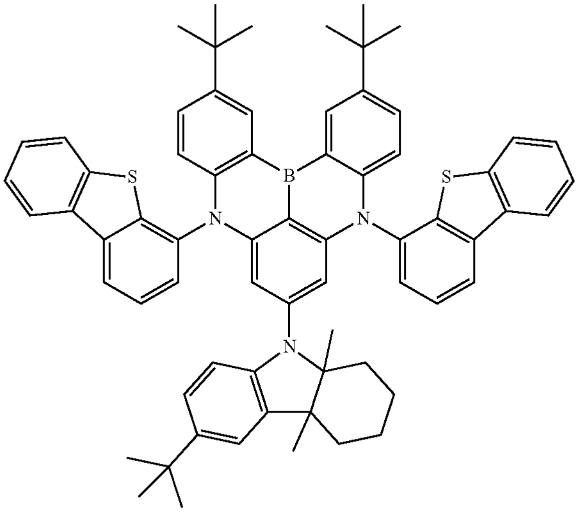
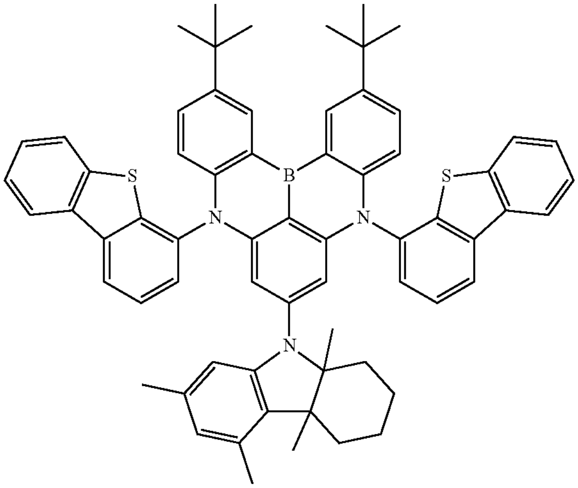

-continued
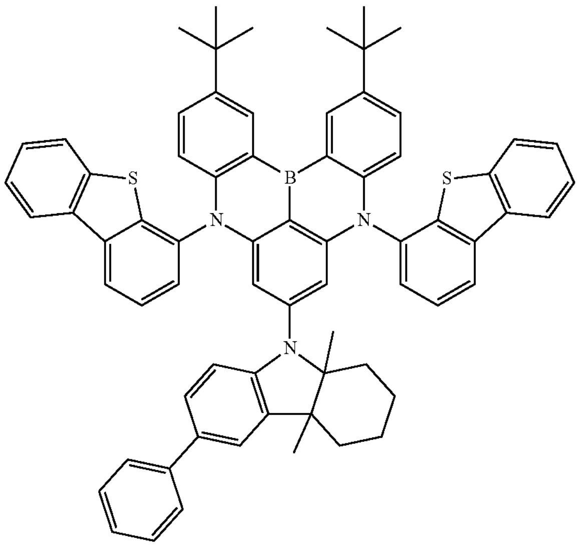
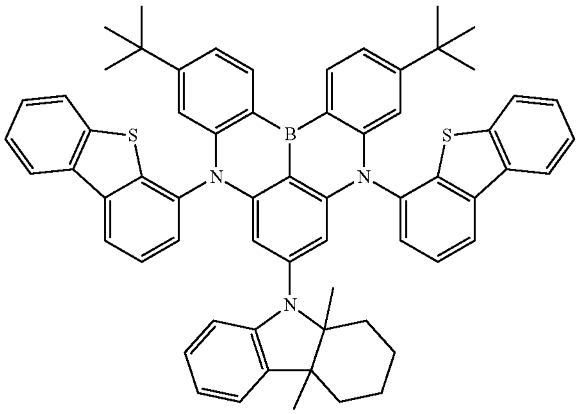
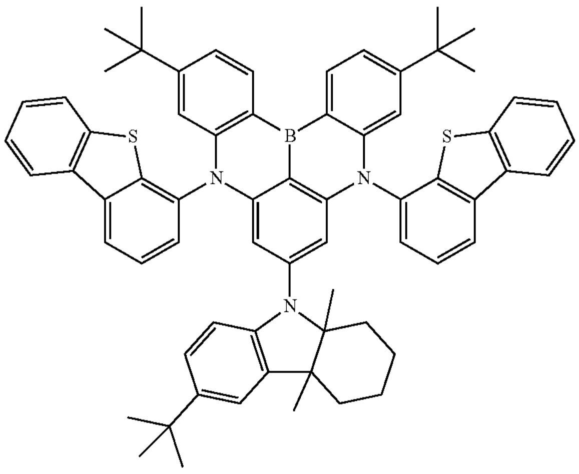
-continued
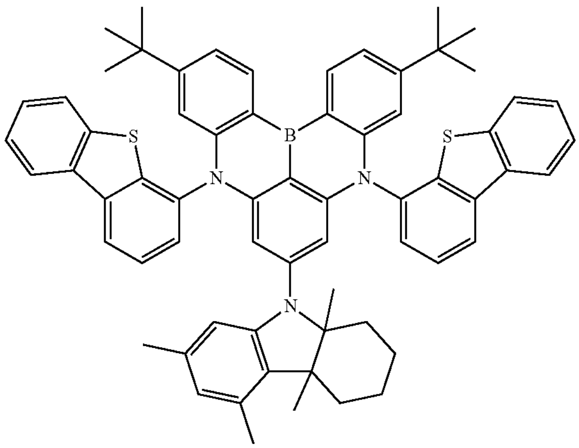
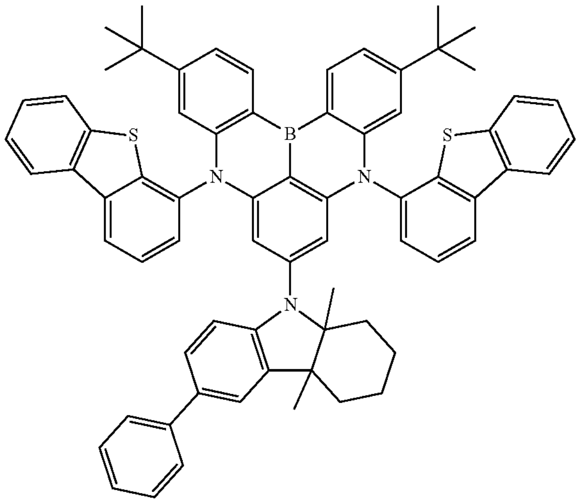
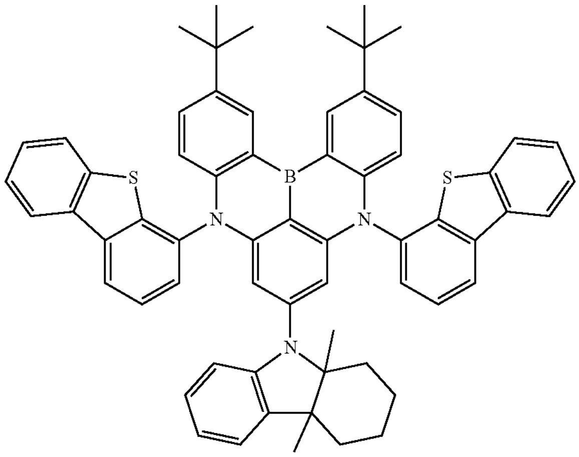

-continued
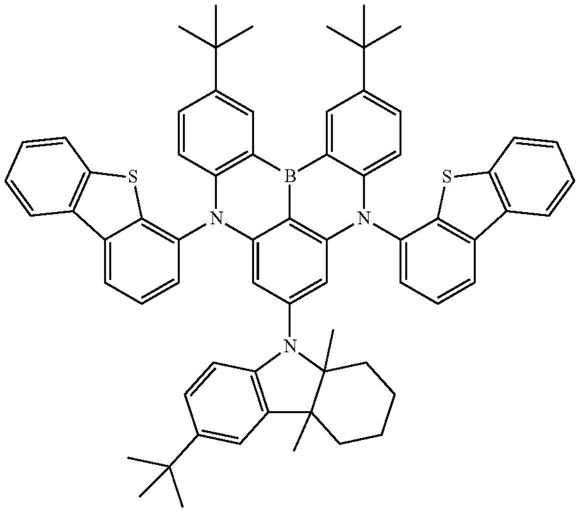
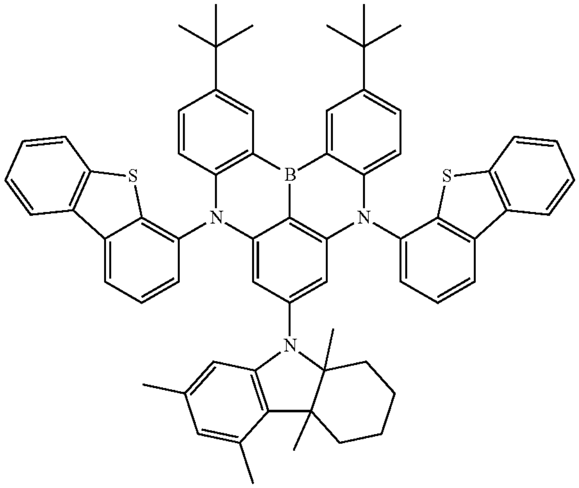
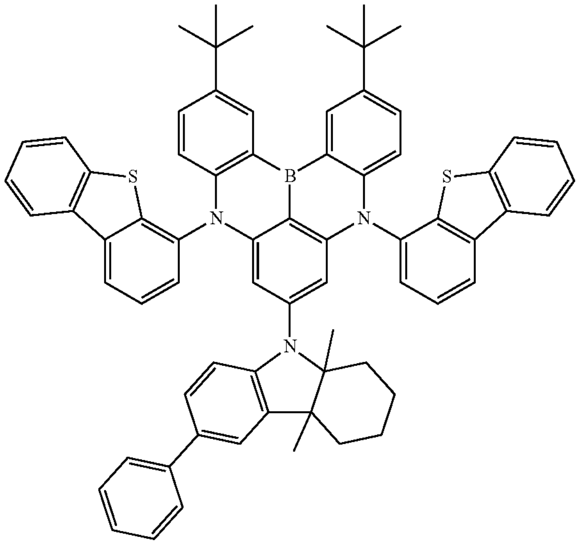
-continued
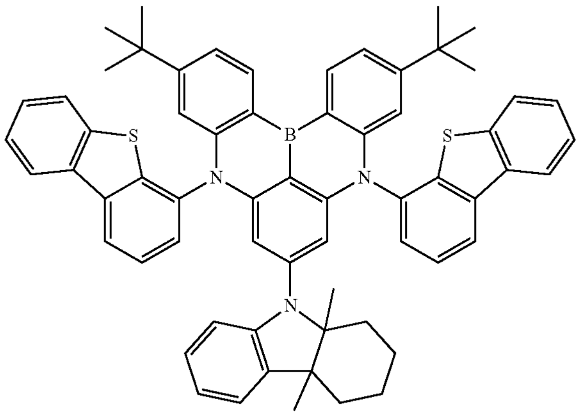
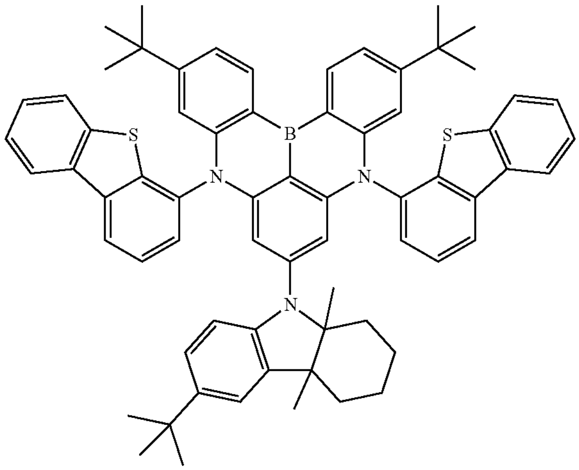
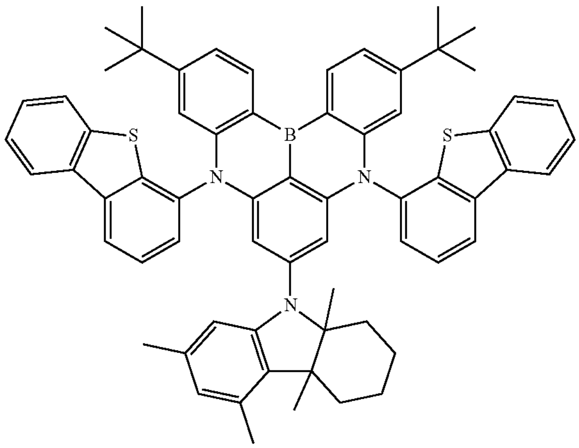

-continued
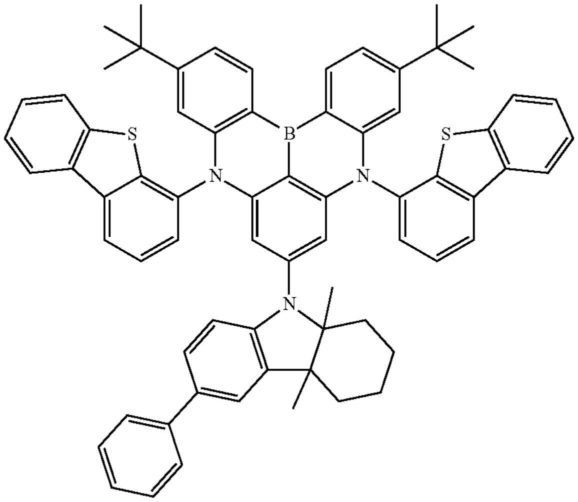
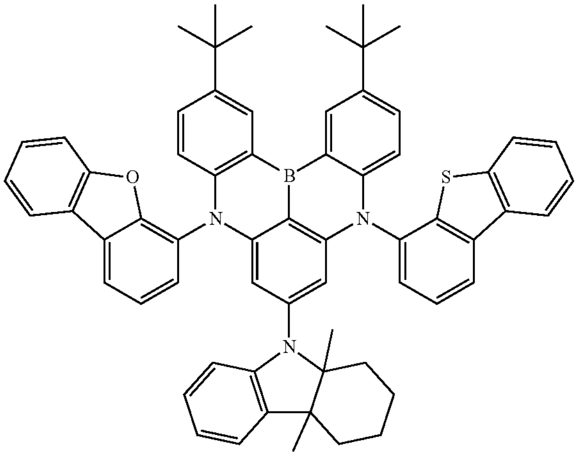
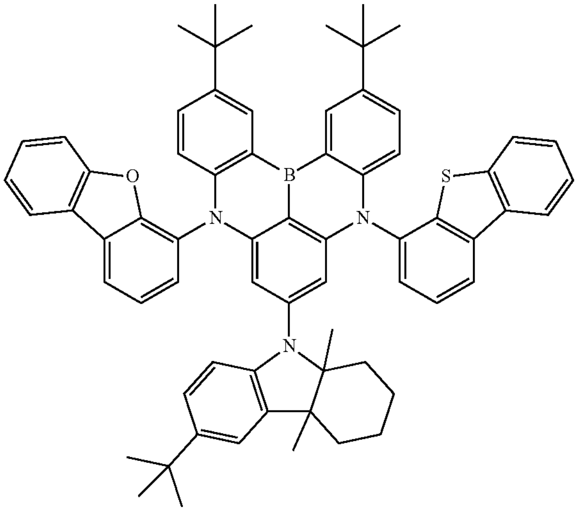
-continued
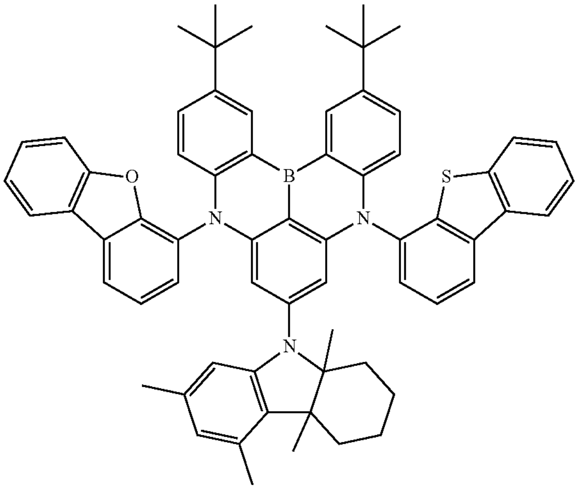
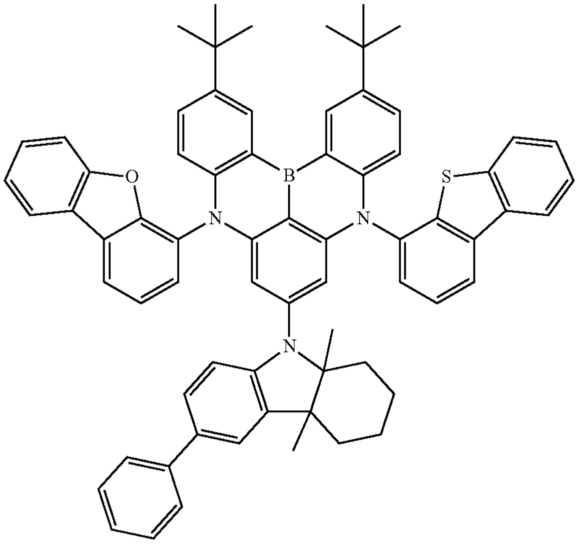
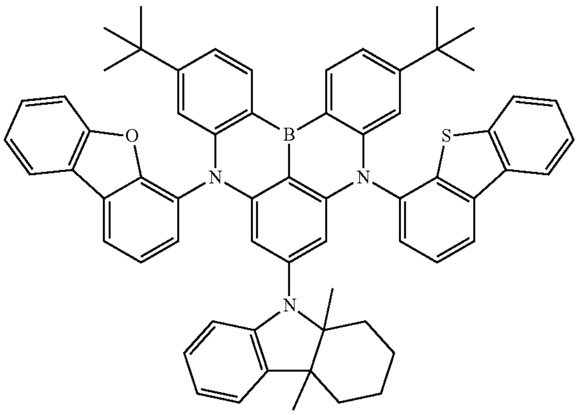

-continued
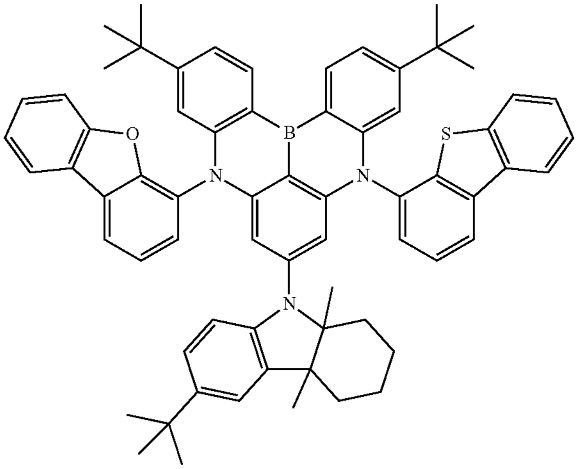
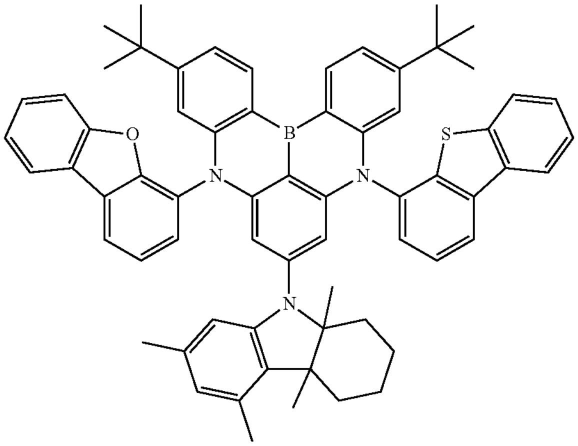
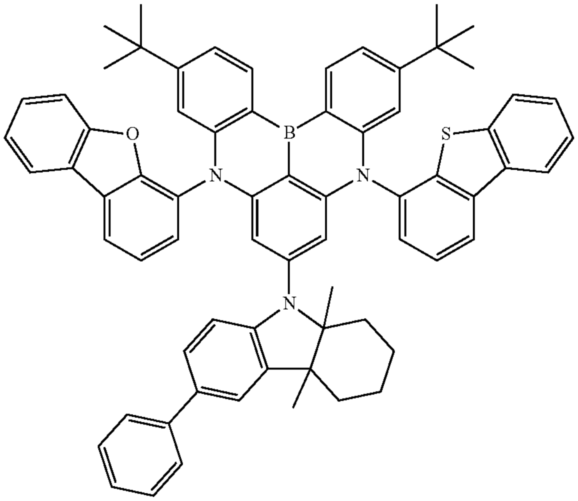
-continued
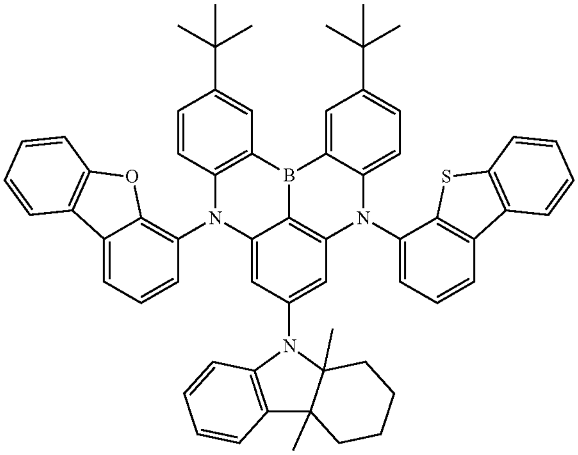
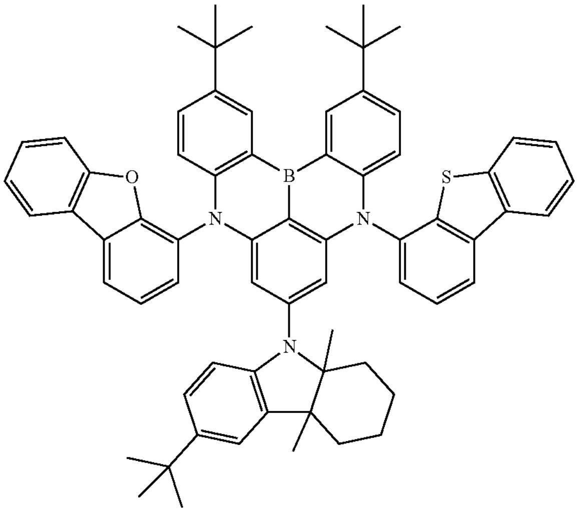
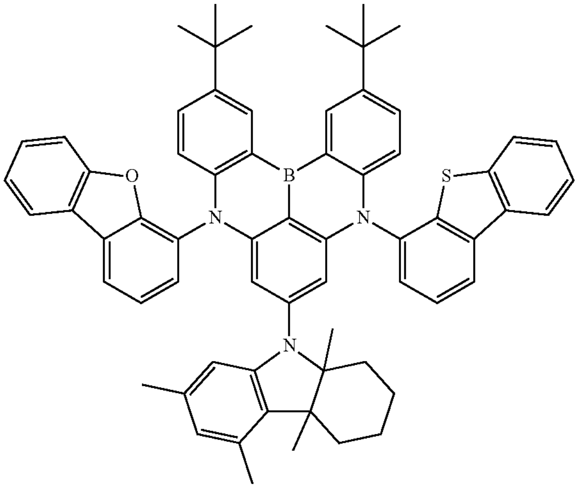

-continued
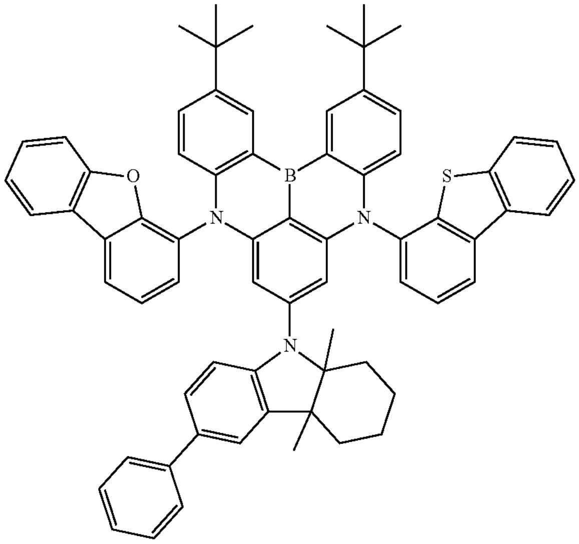
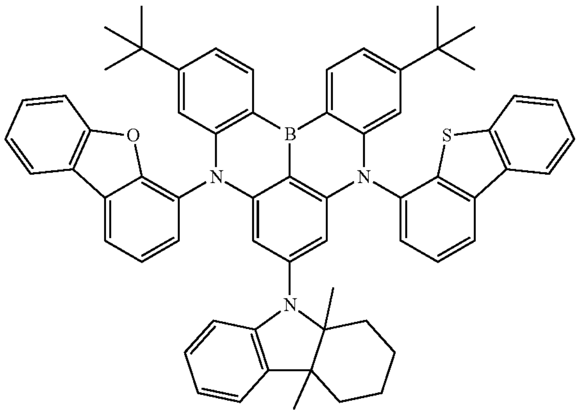
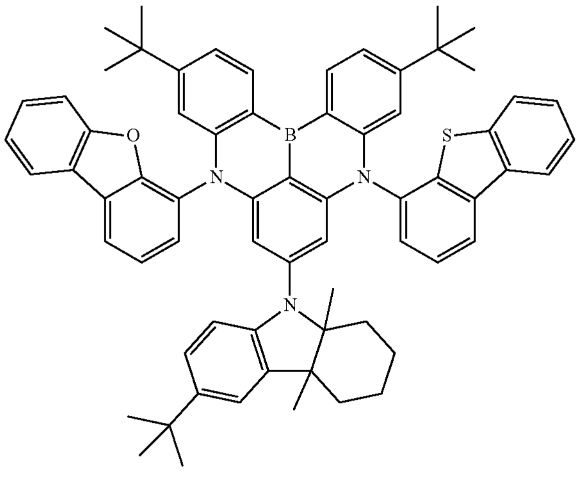
-continued
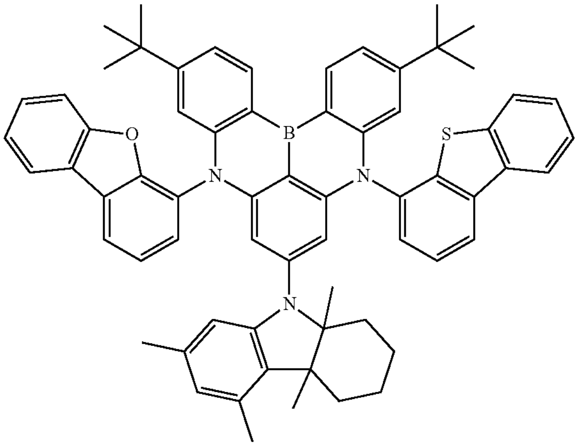
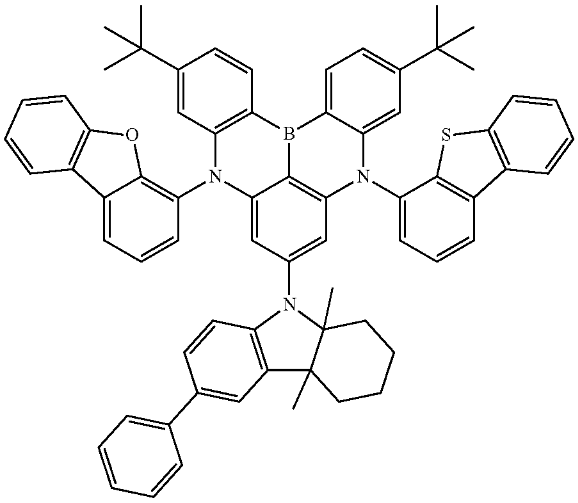
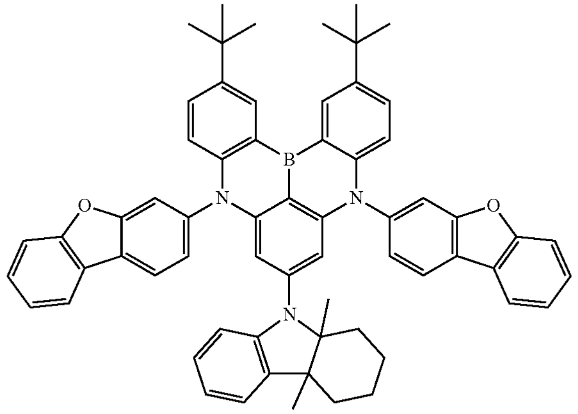

-continued
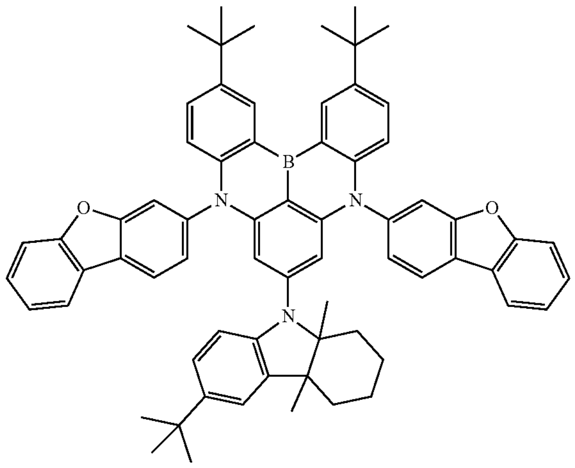
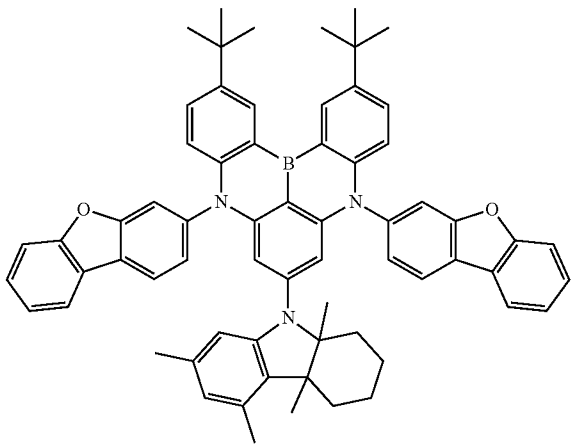
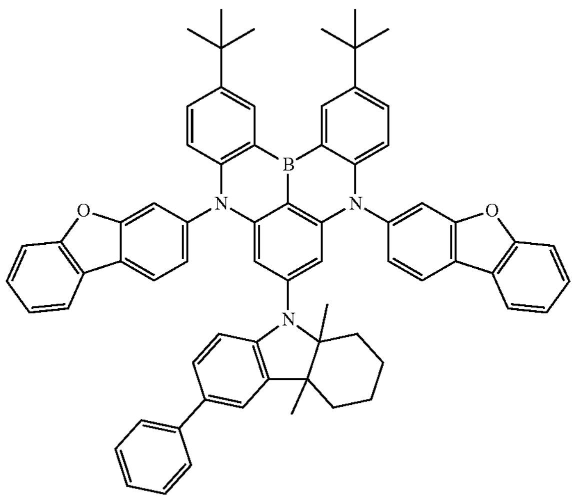
-continued
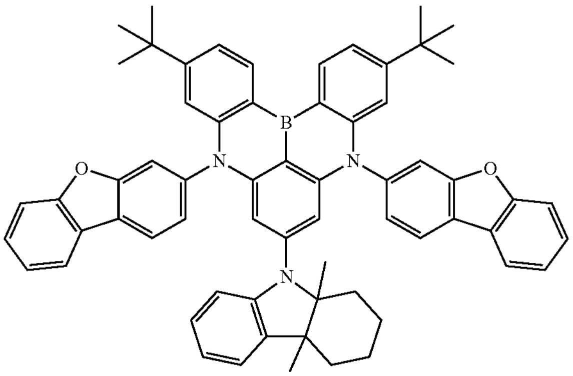
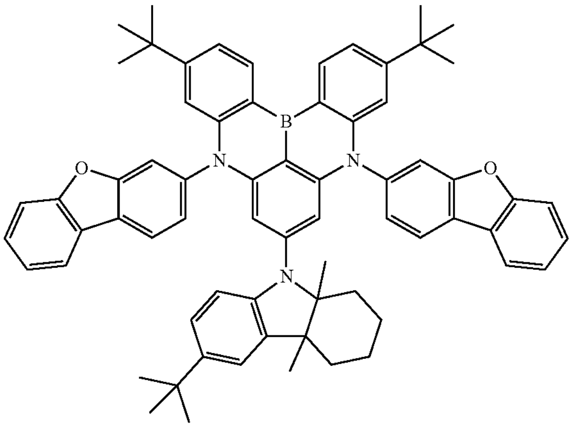
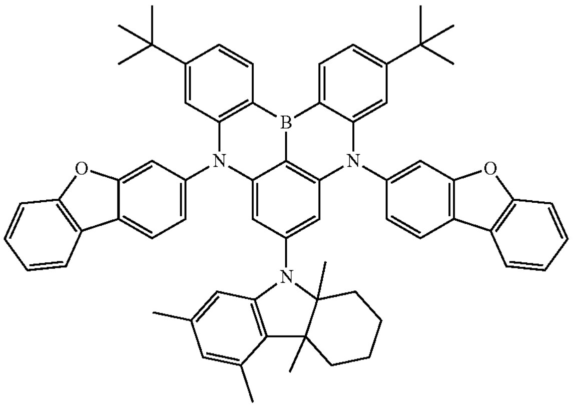
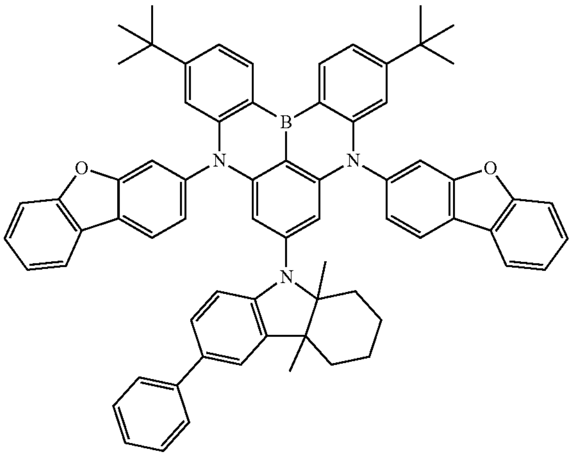

-continued
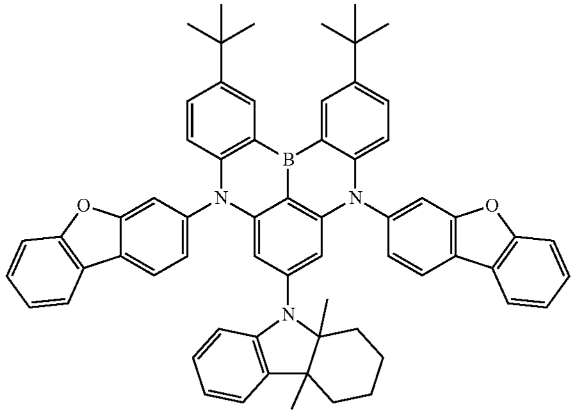
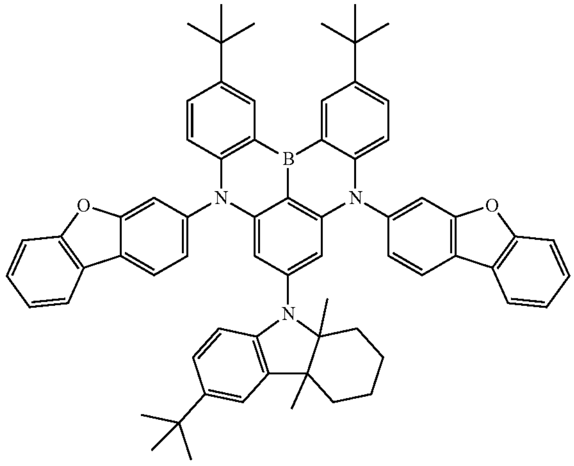
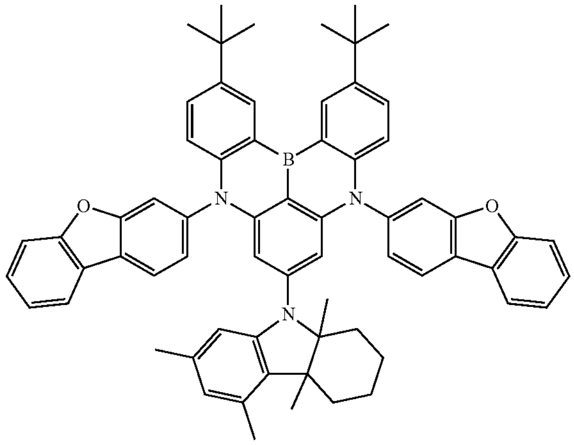
-continued
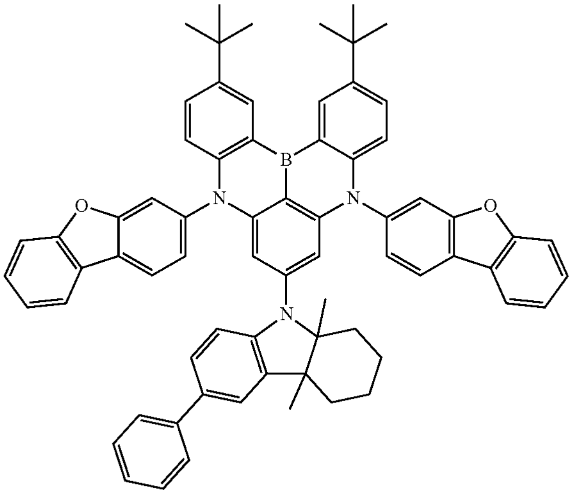
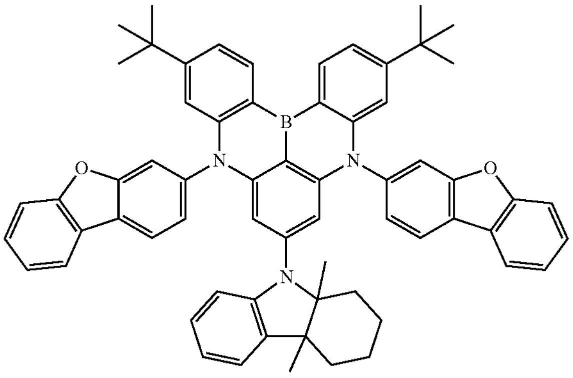
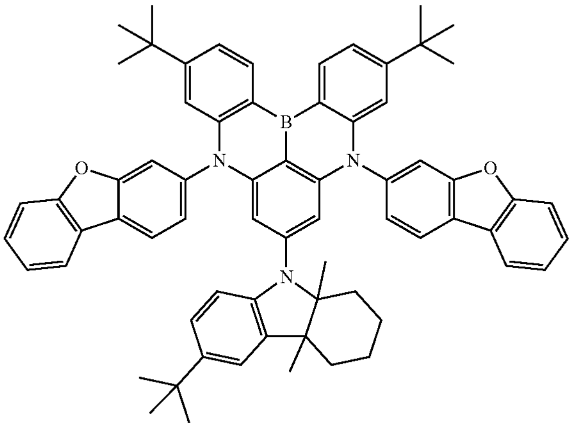
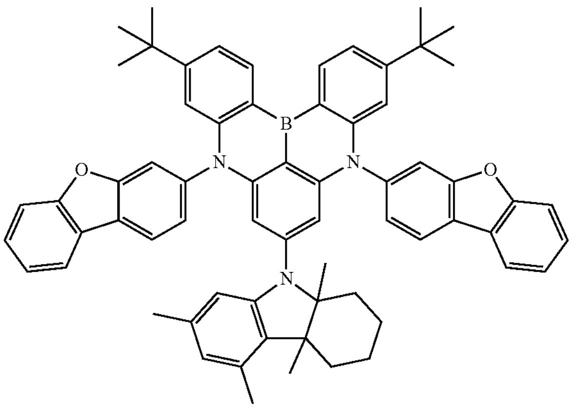

-continued
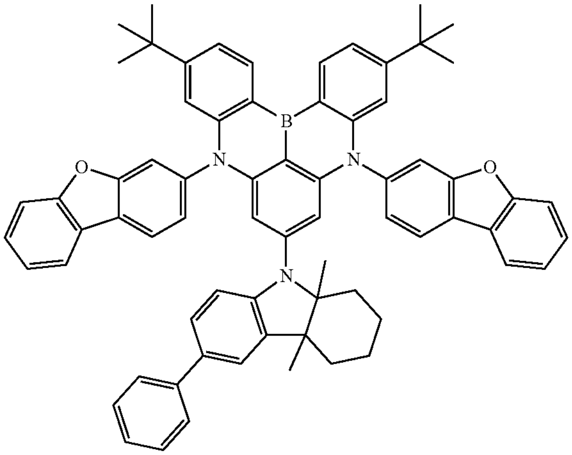
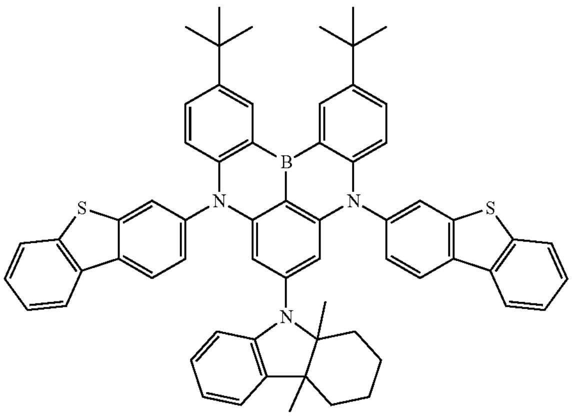
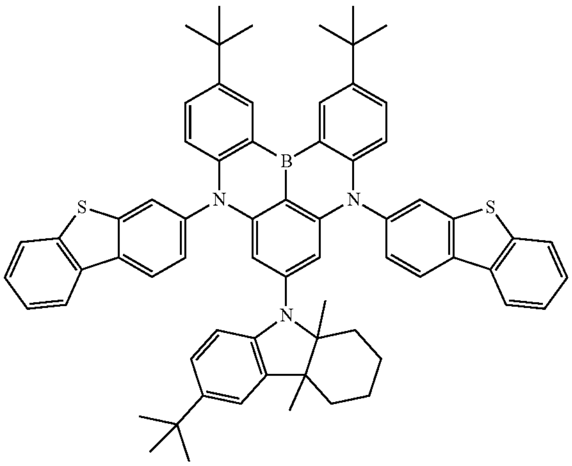
-continued
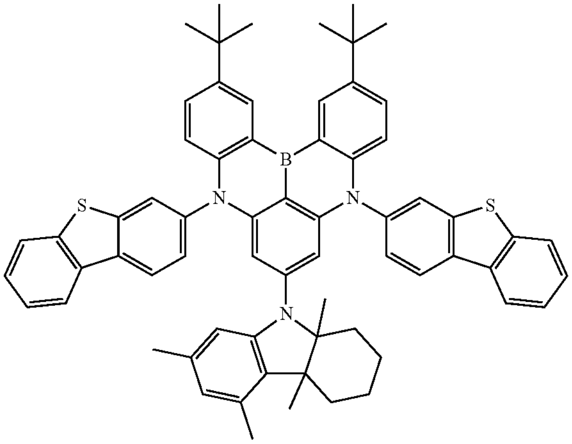
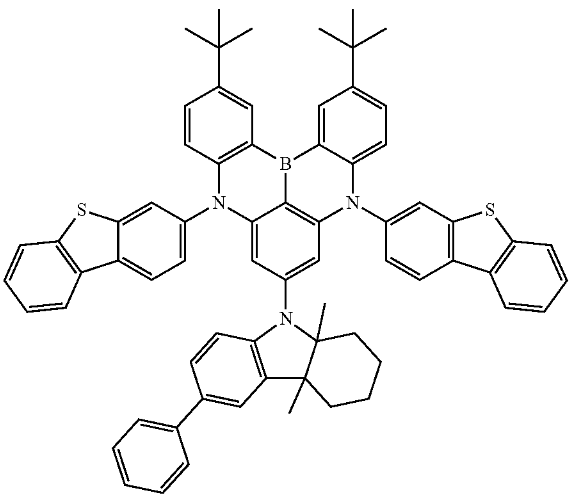
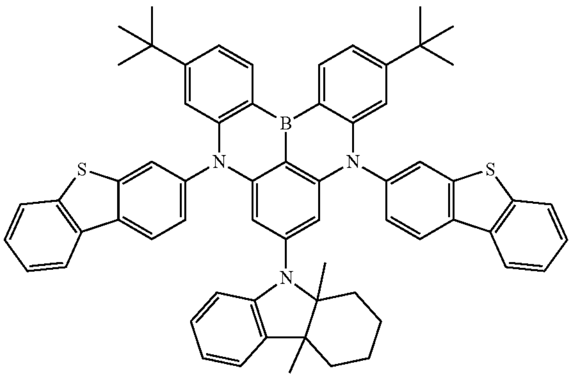

-continued
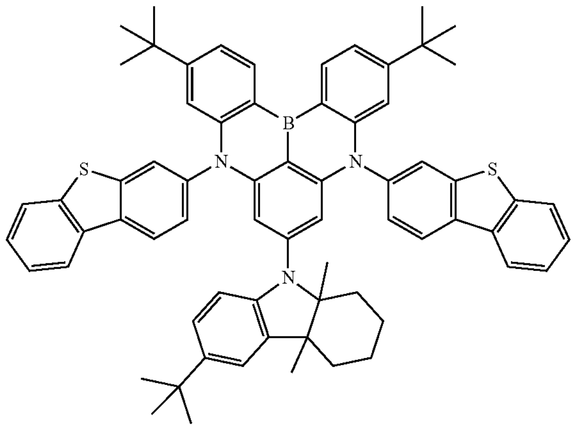
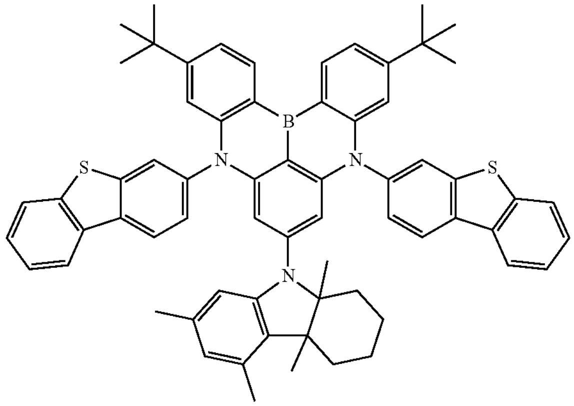
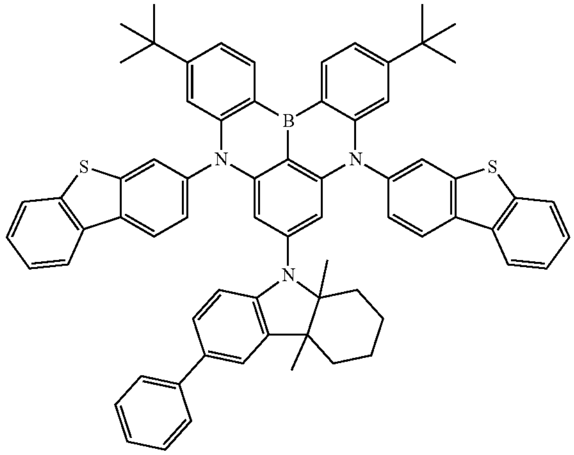
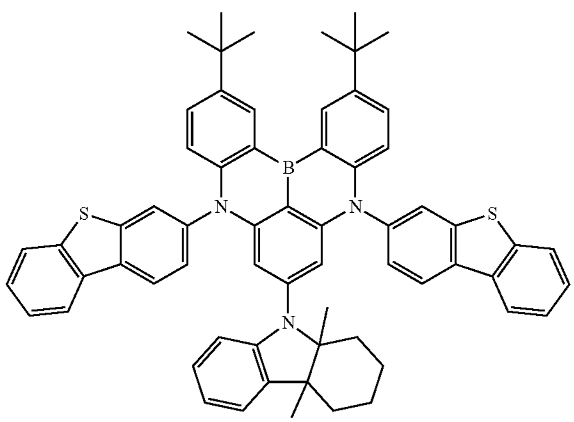
-continued
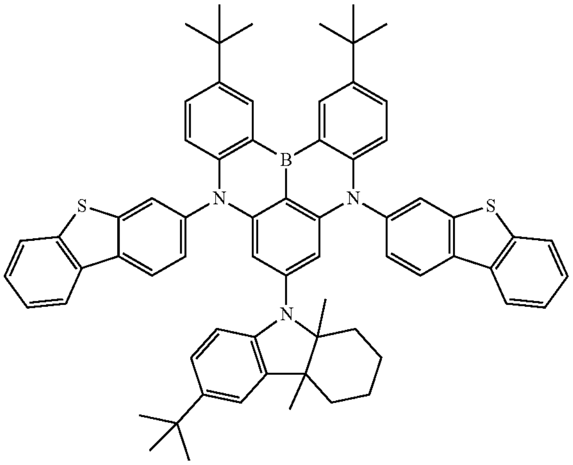
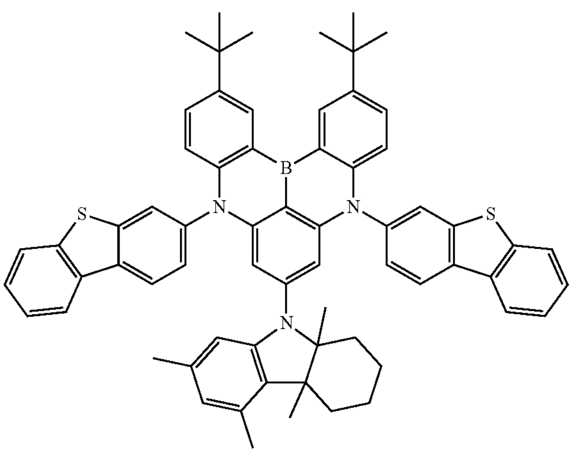
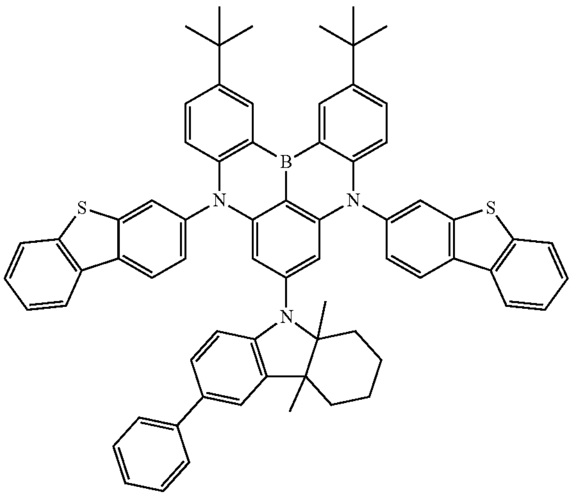

-continued
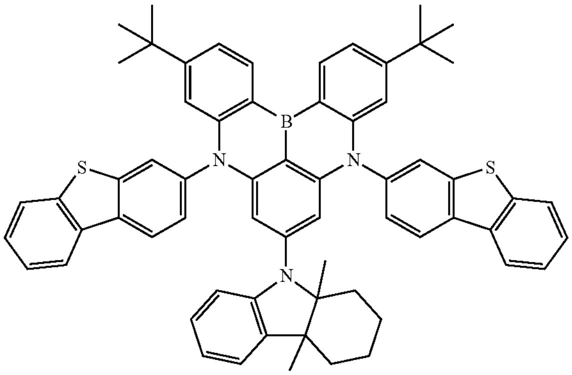
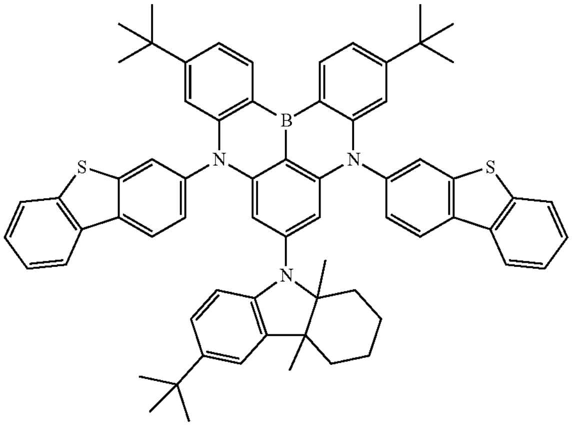
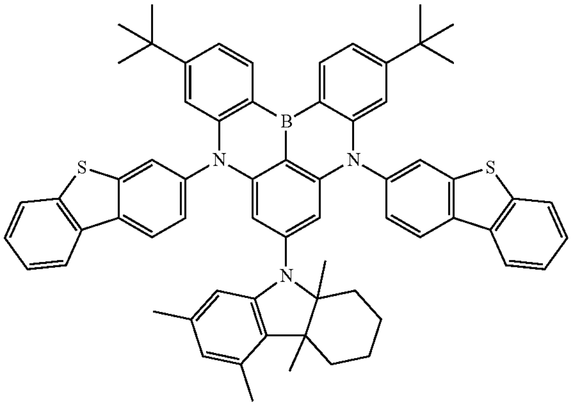
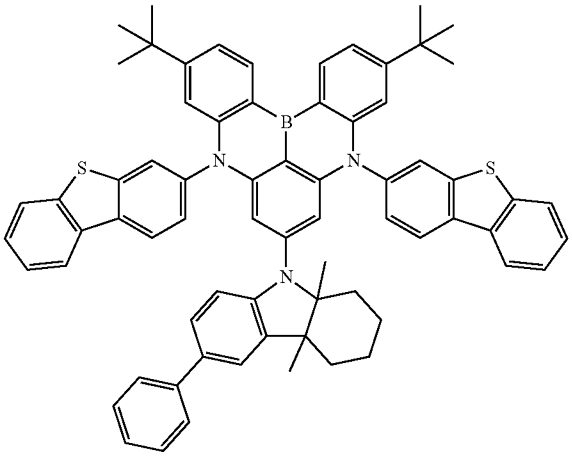
-continued
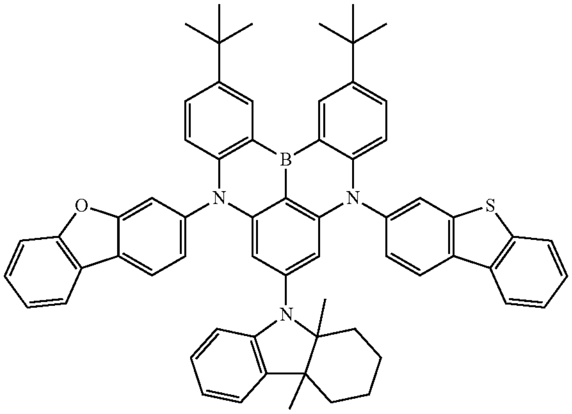
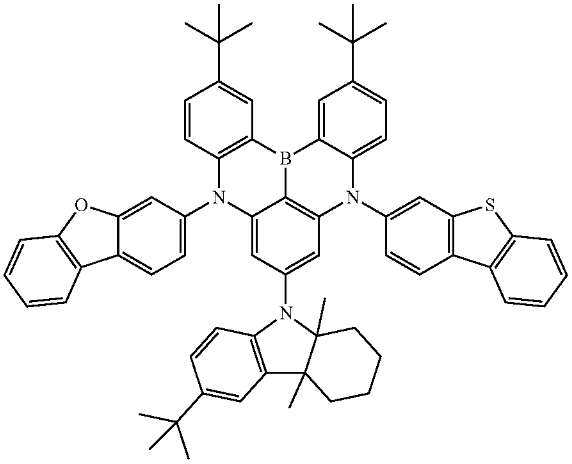
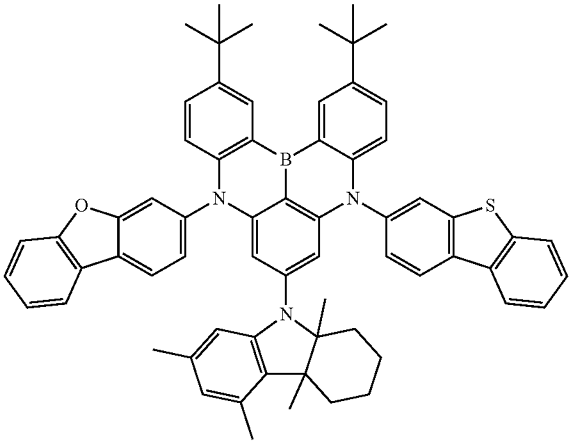

-continued
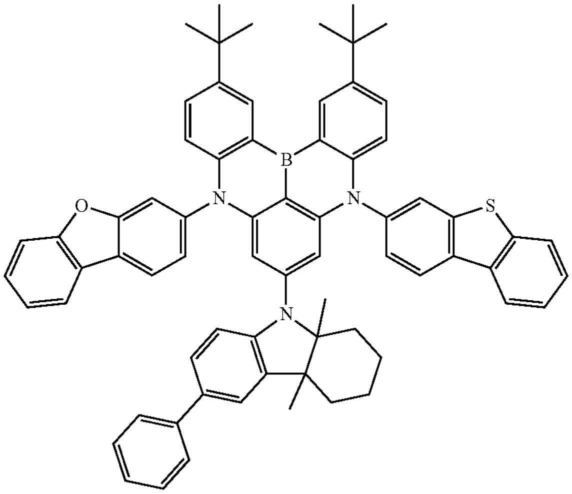
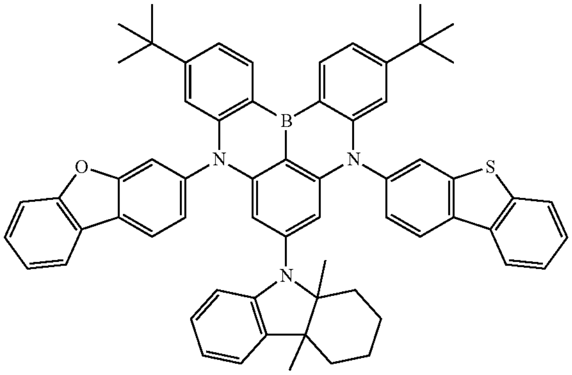
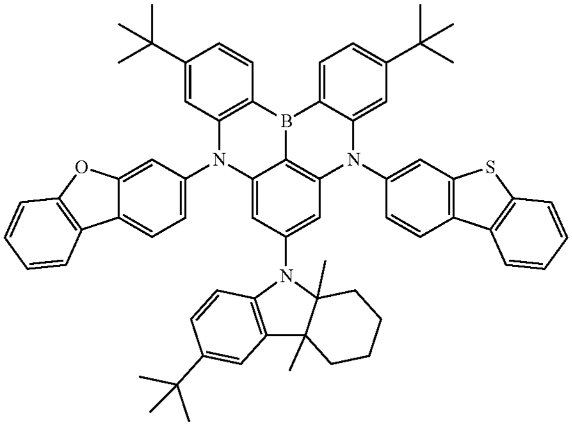
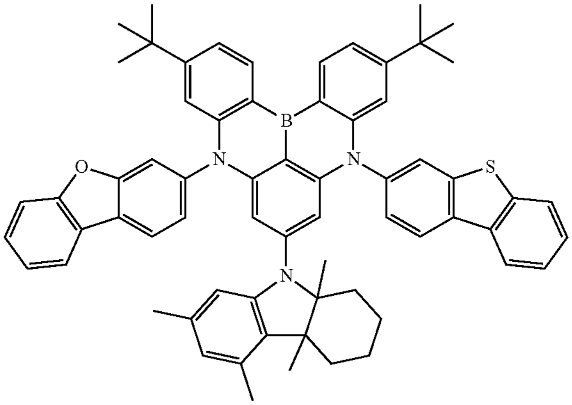
-continued
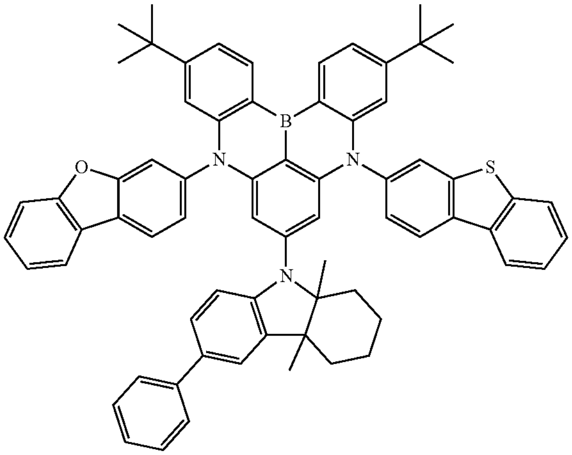
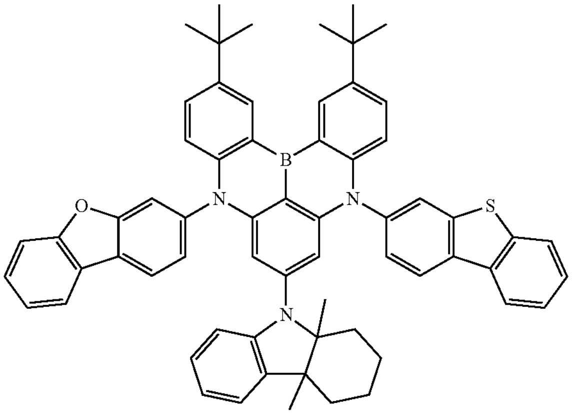
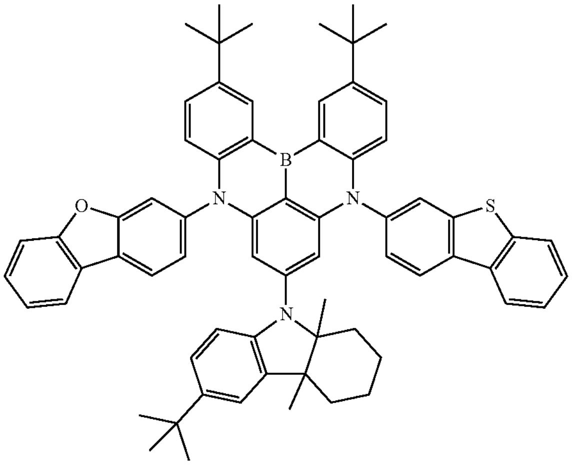

-continued
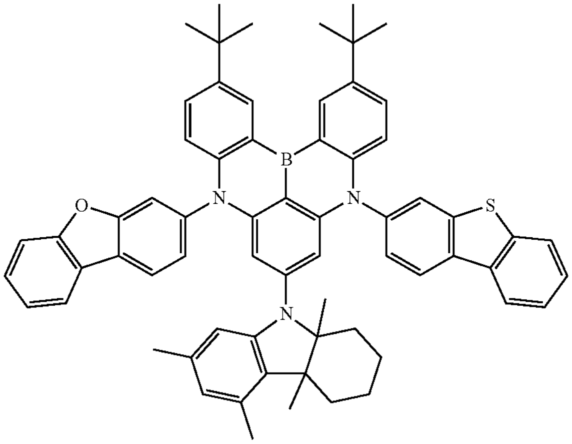
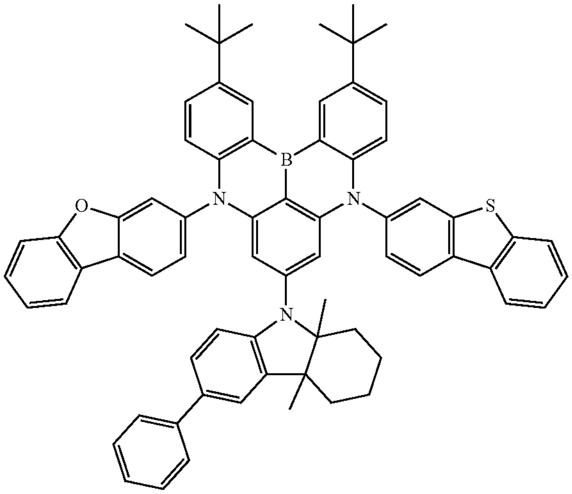
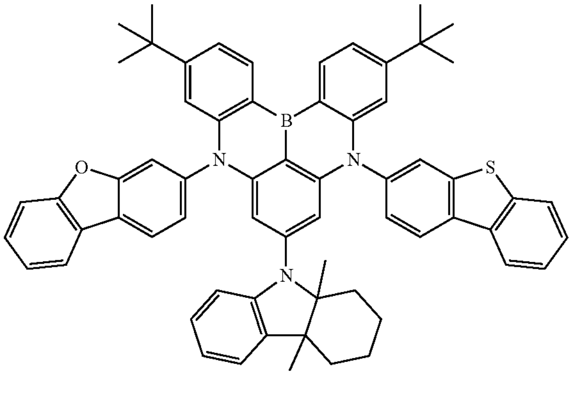
-continued
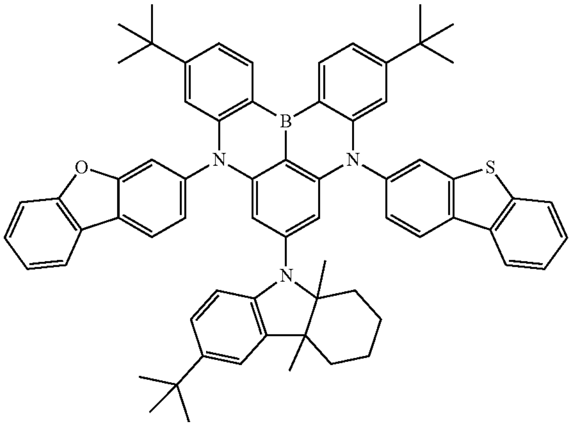
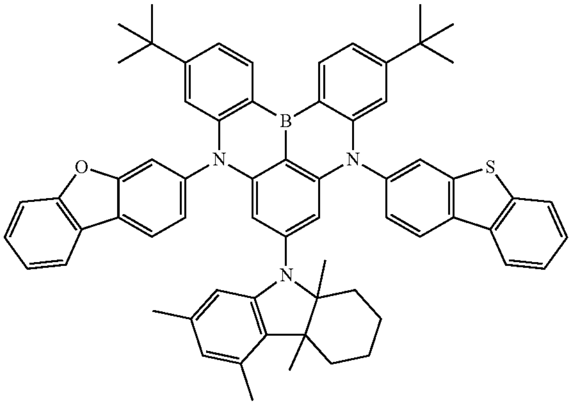
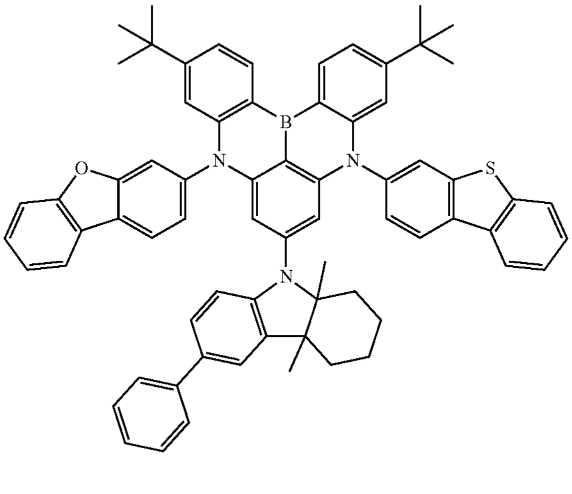

-continued
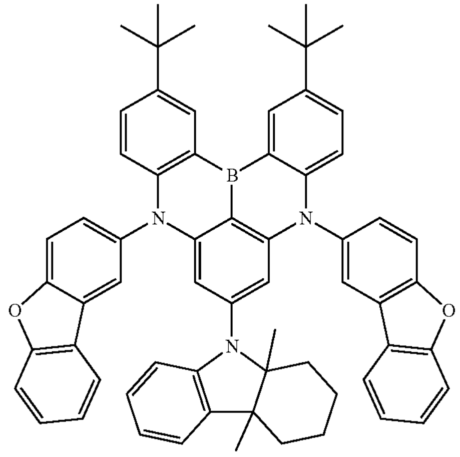
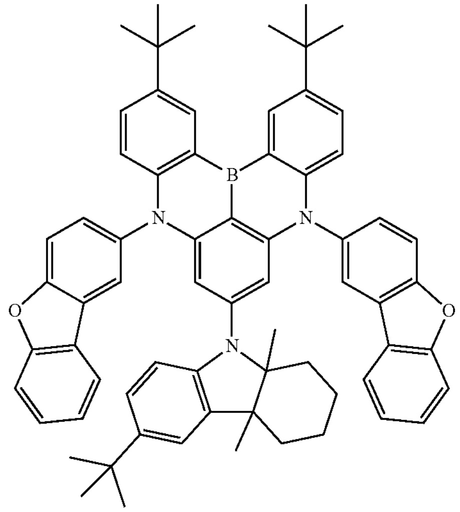
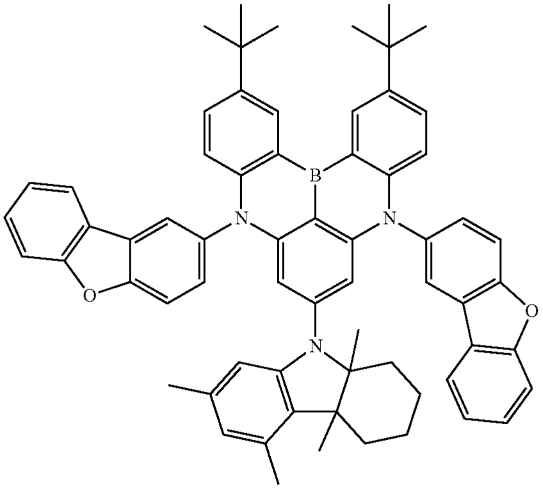
-continued
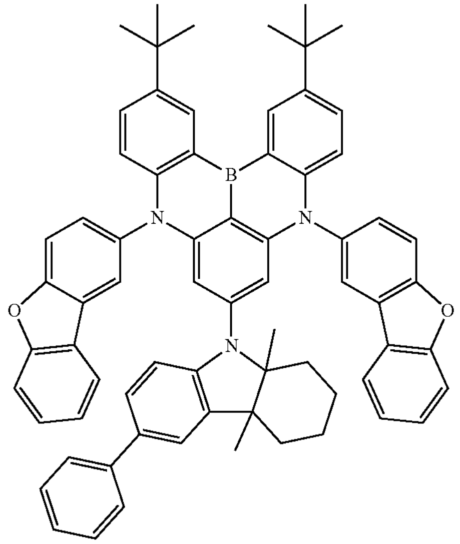
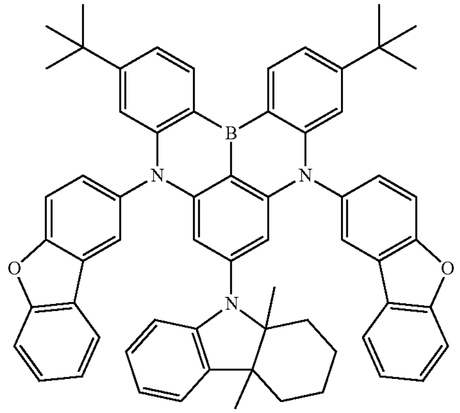
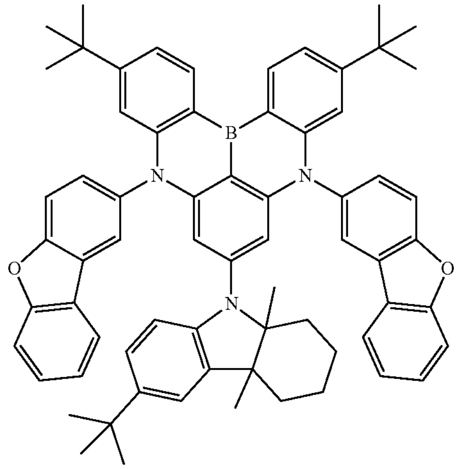

-continued
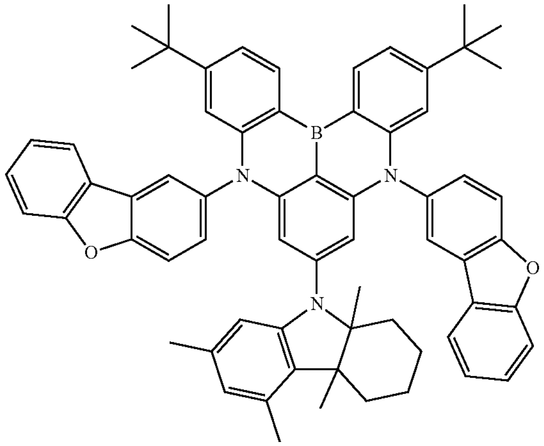
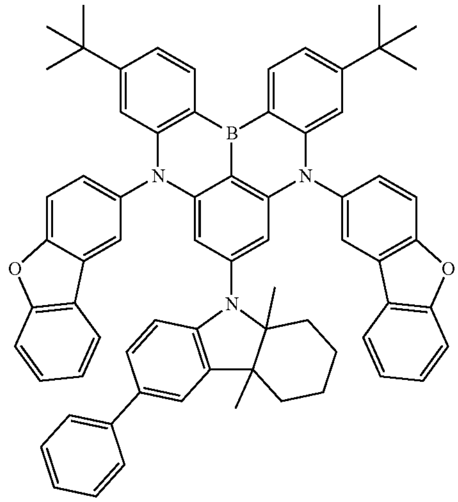
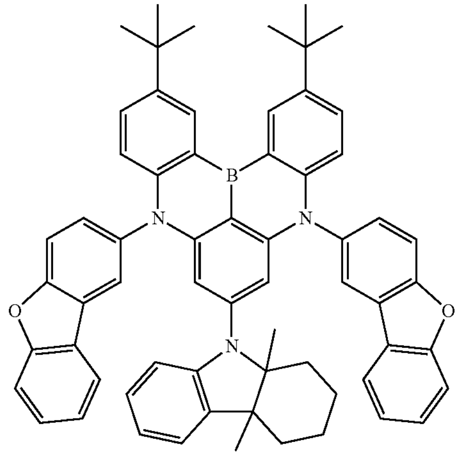
-continued
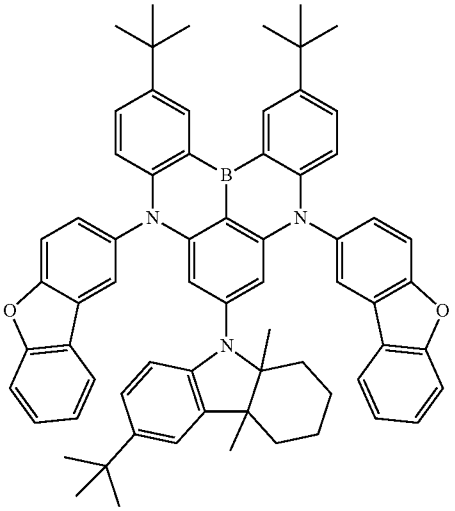
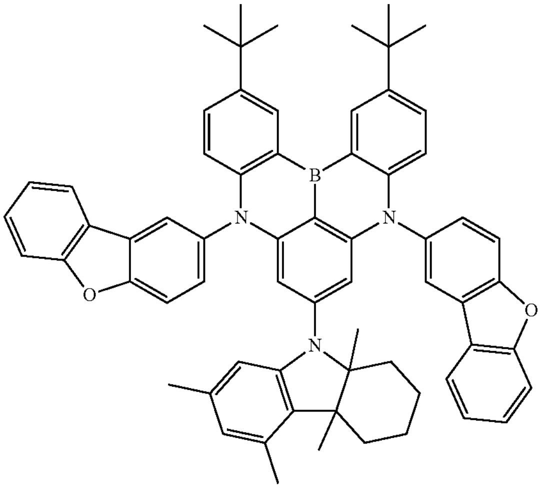
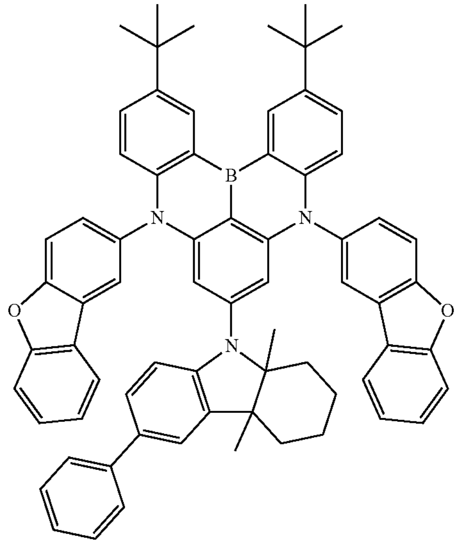

-continued
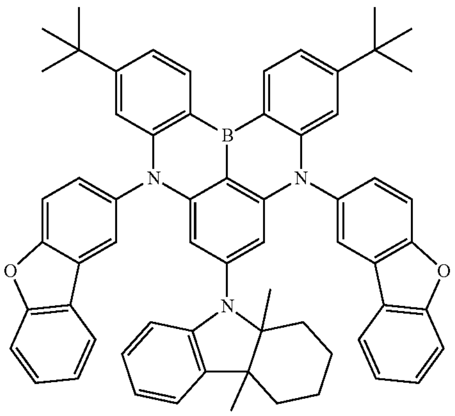
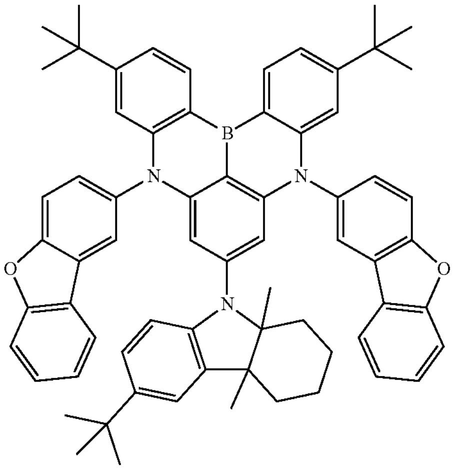
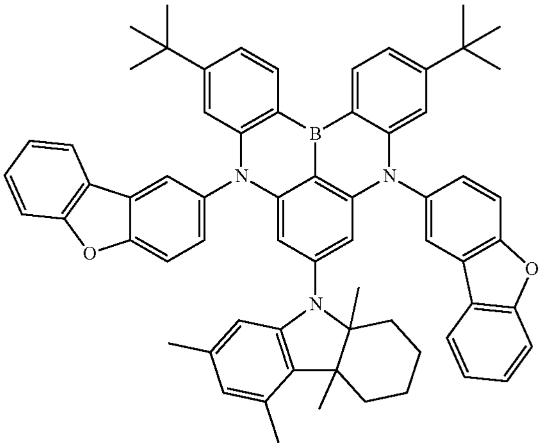
-continued
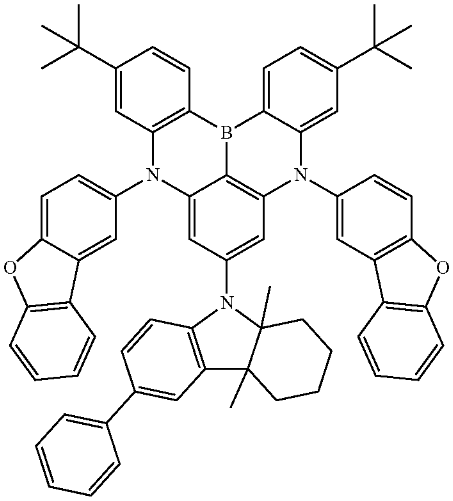
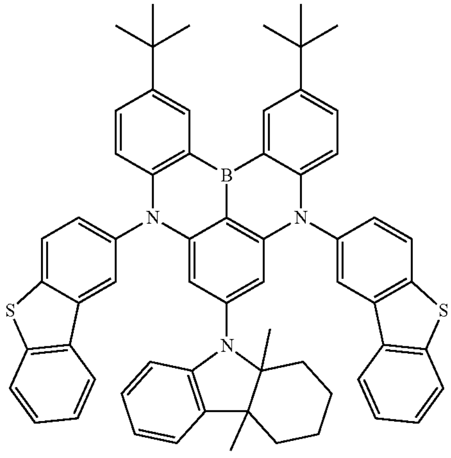
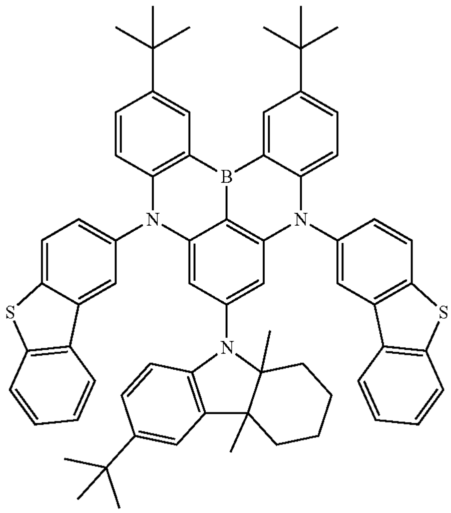

-continued
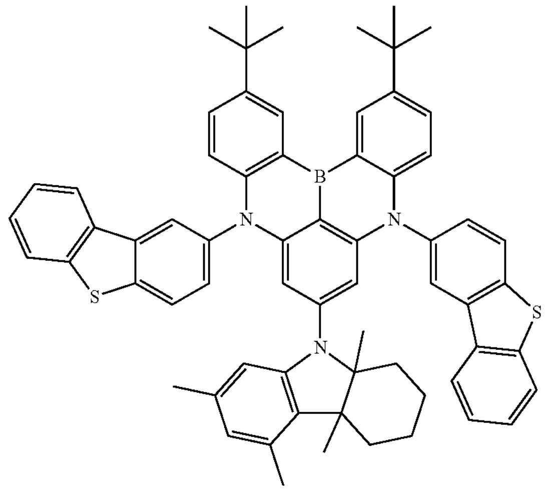
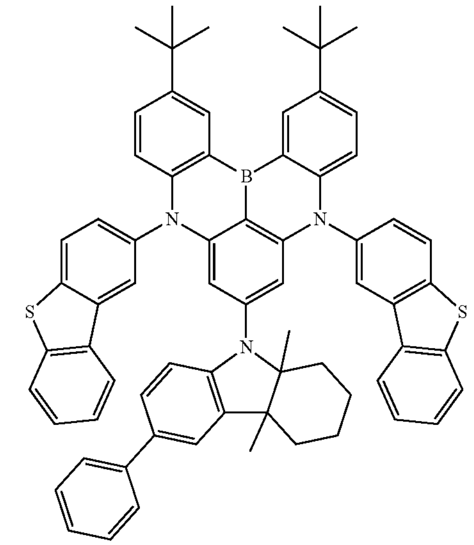
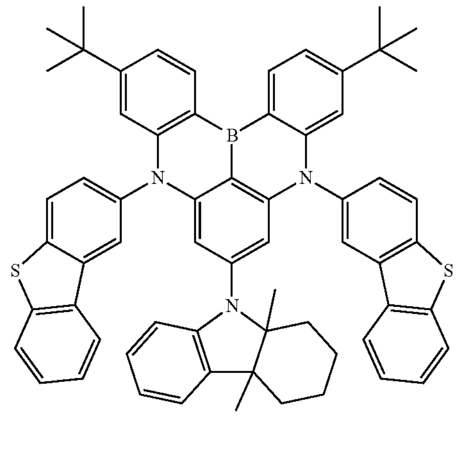
-continued
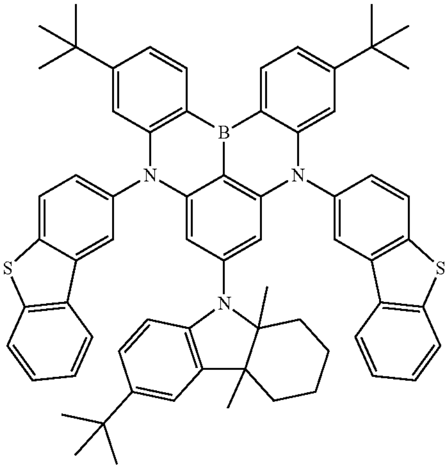
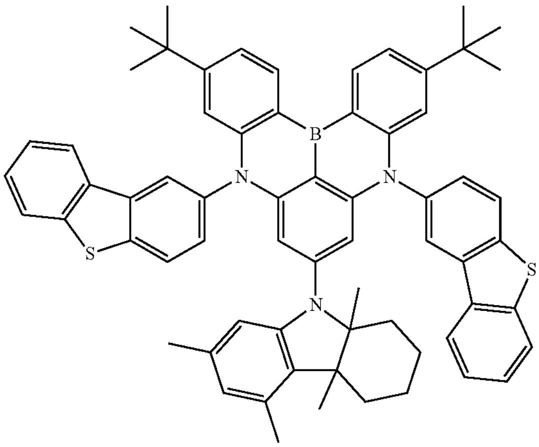
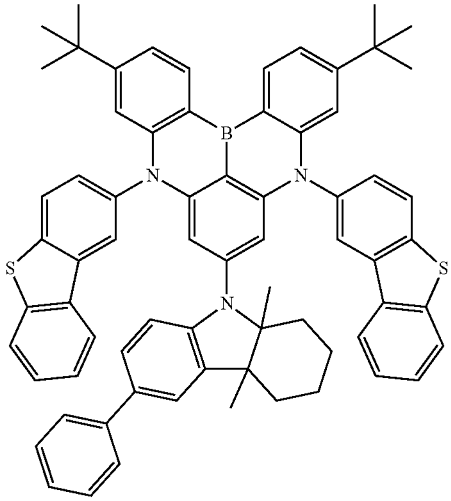

-continued
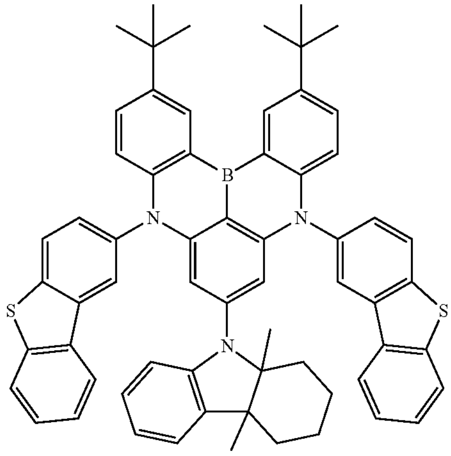
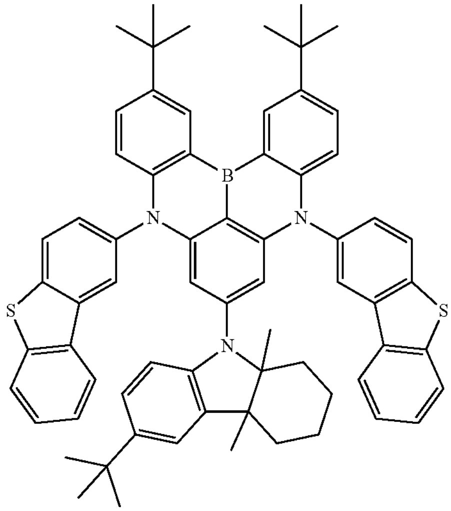
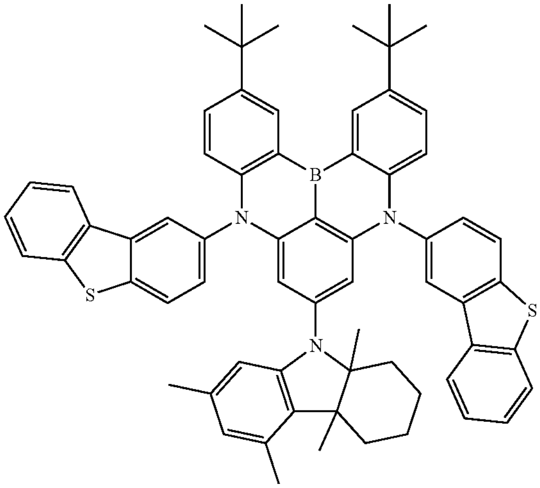
-continued
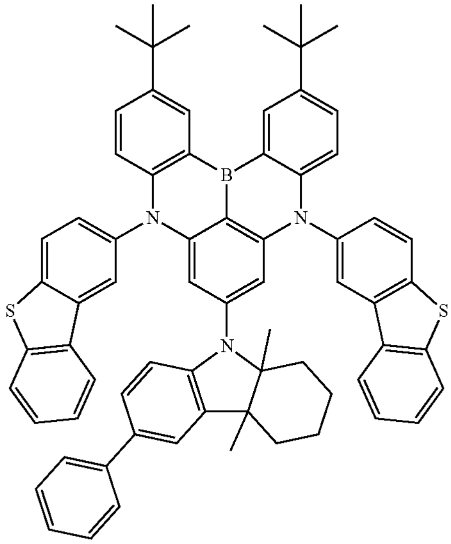
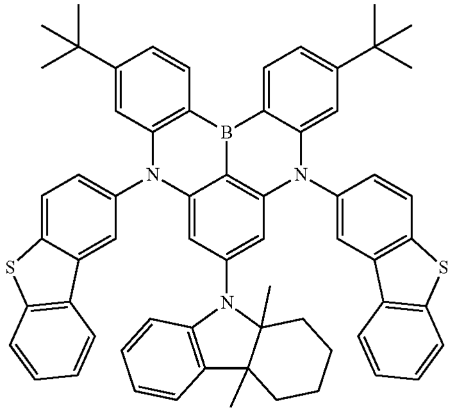
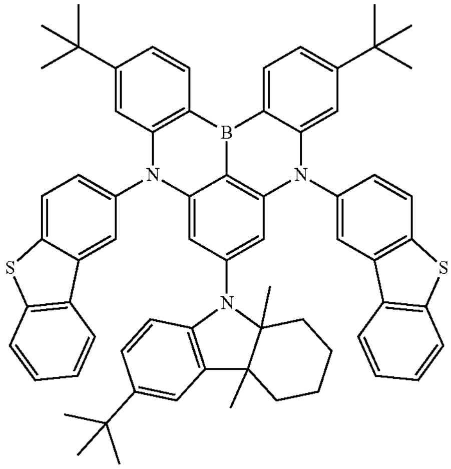

-continued
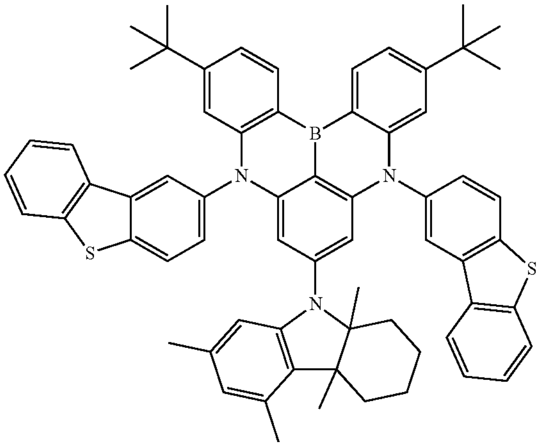
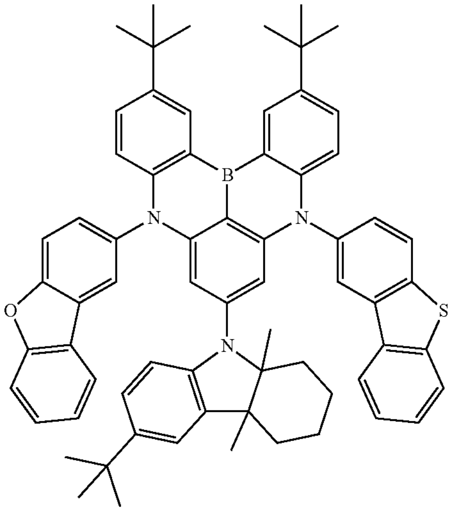
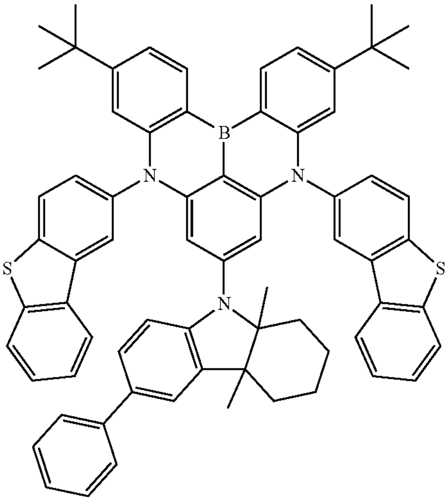
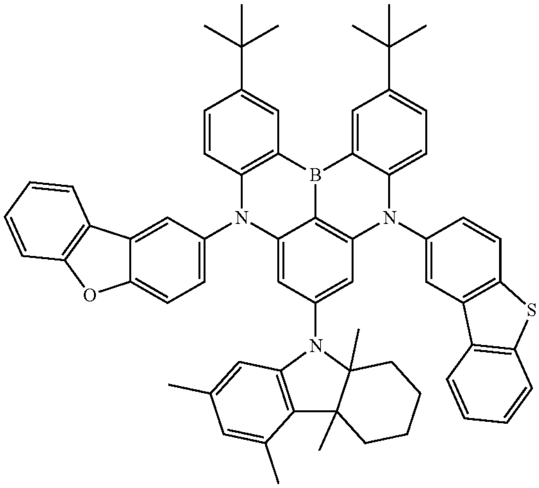
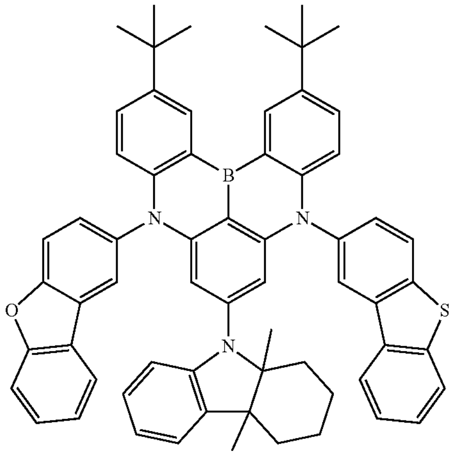
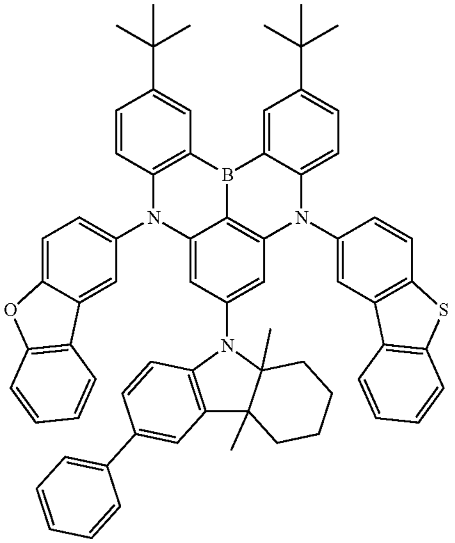
-continued -continued
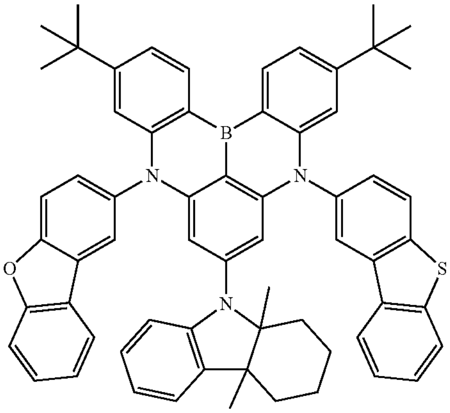
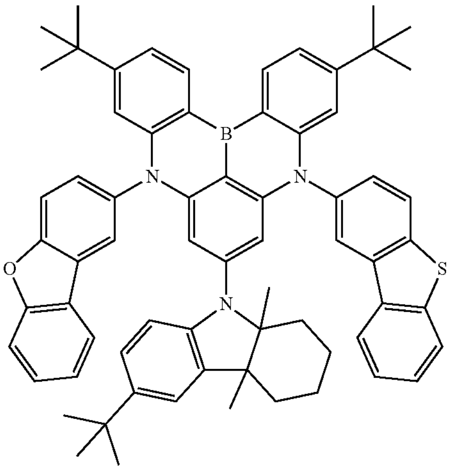
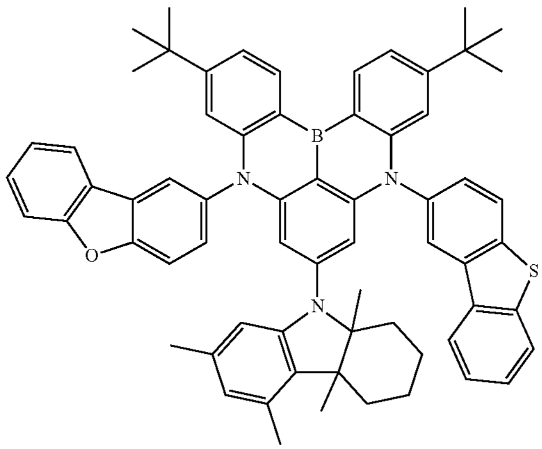
-continued
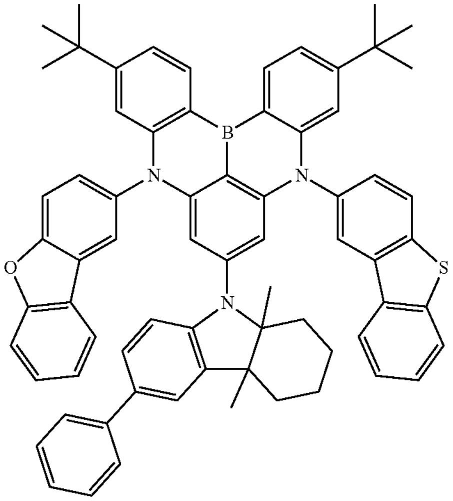
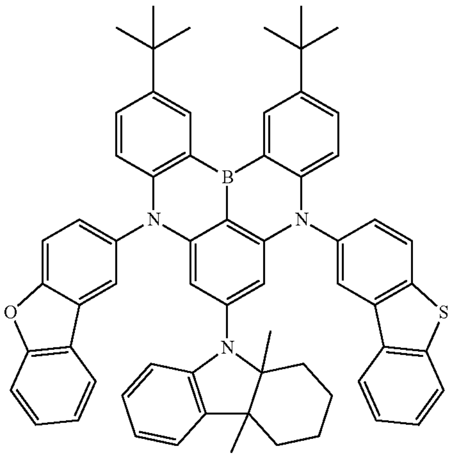
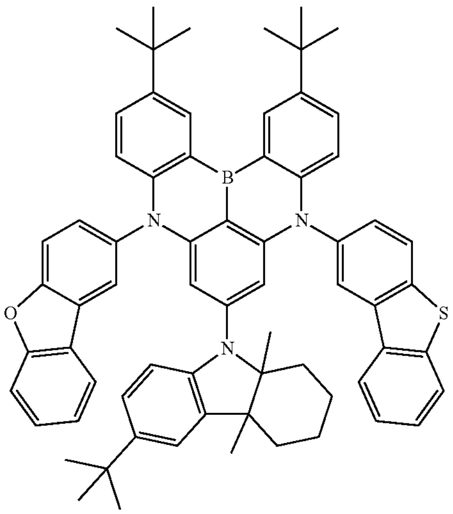

-continued
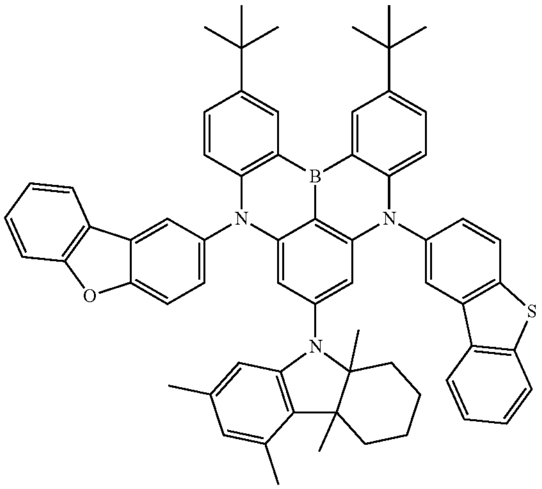
-continued
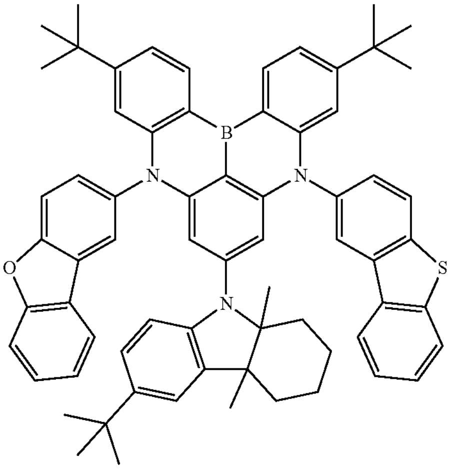
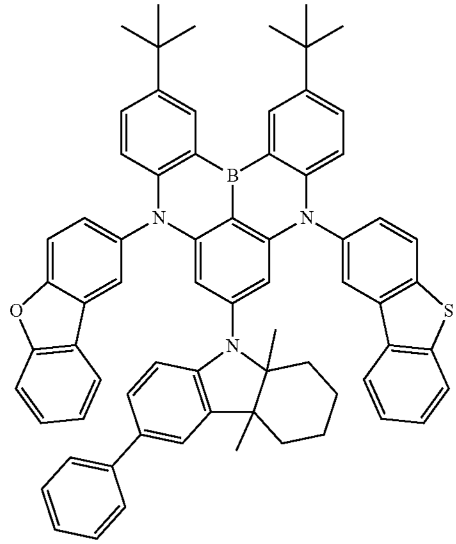
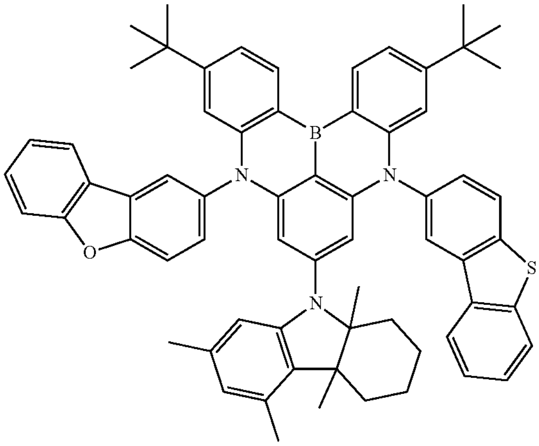
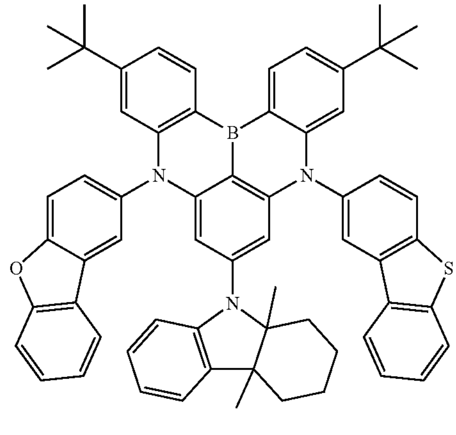
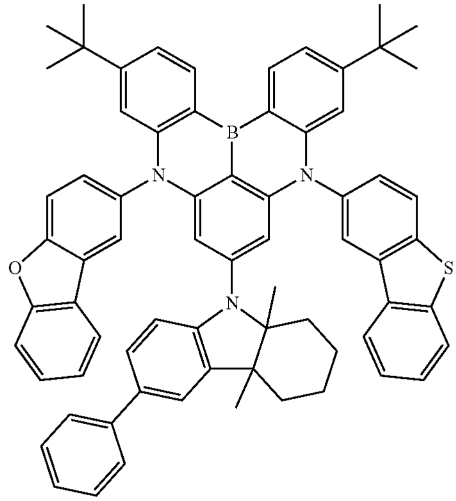

-continued
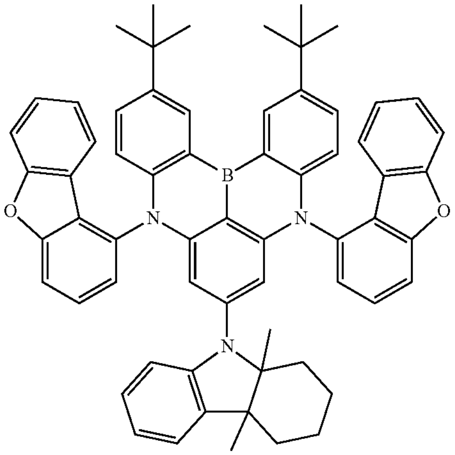
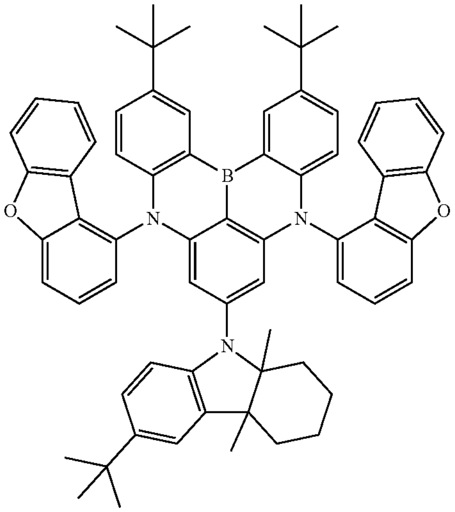
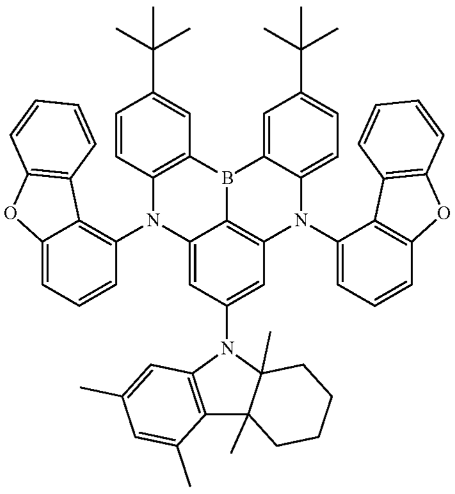
-continued
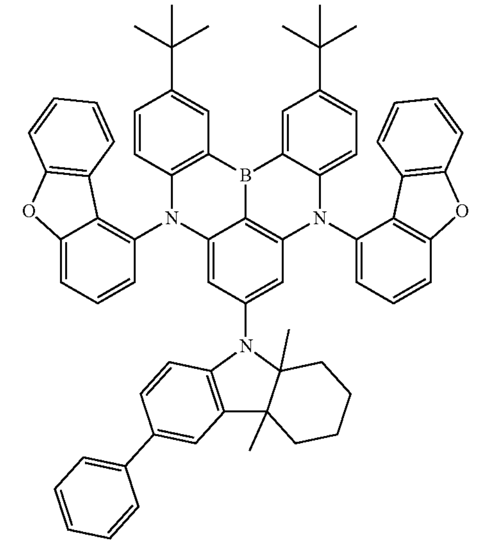
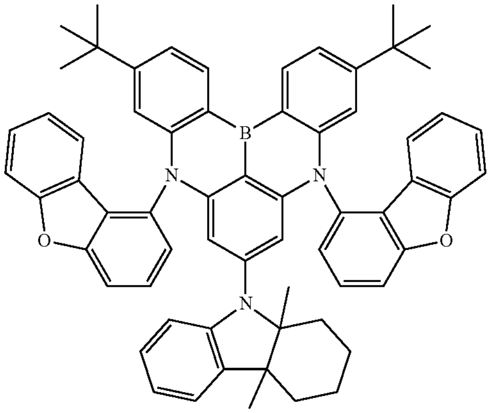
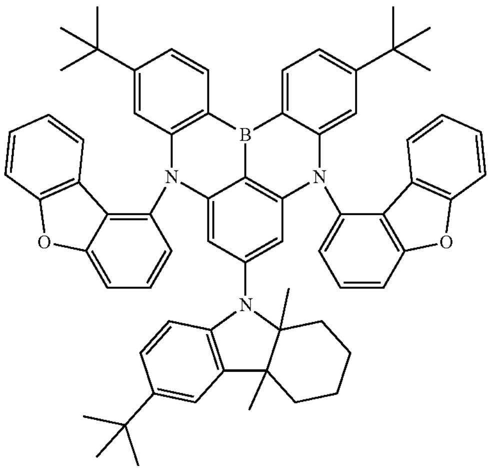

-continued
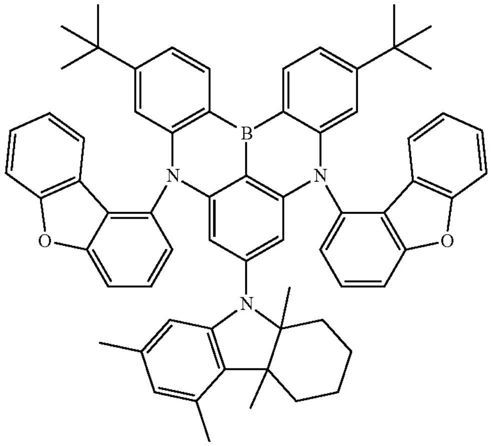
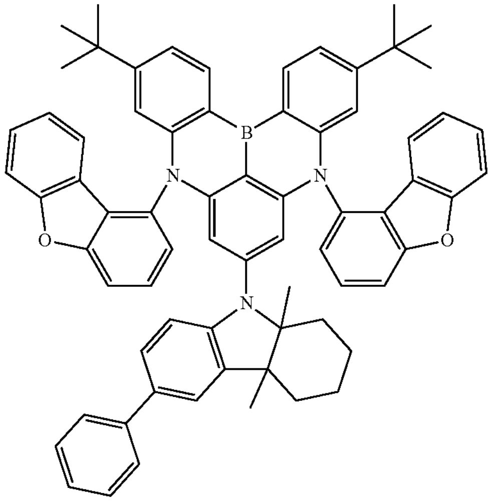
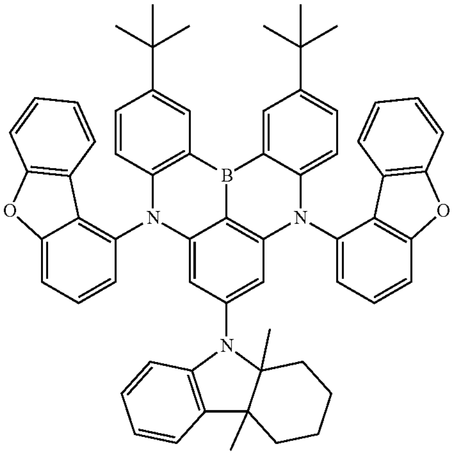
-continued
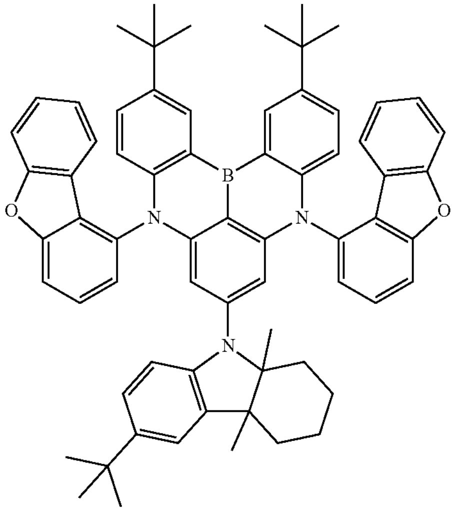
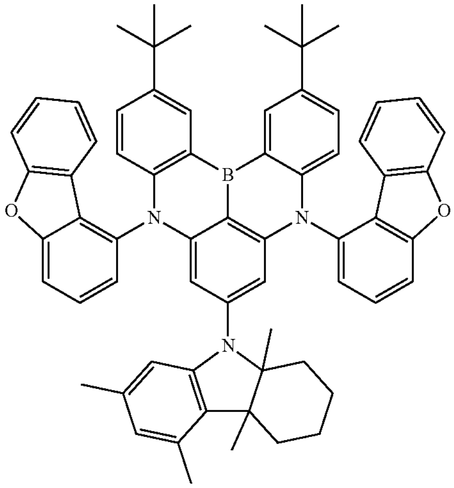
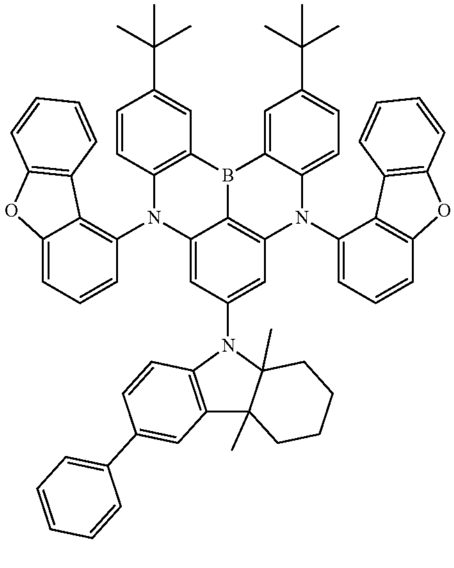

-continued
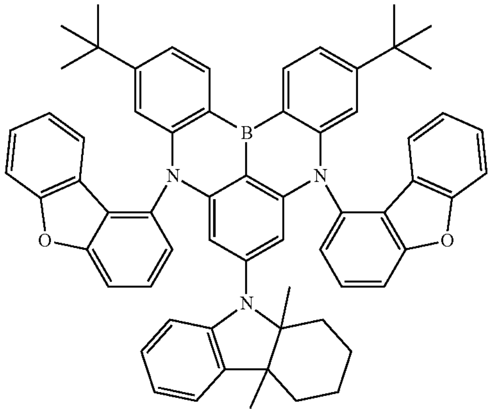
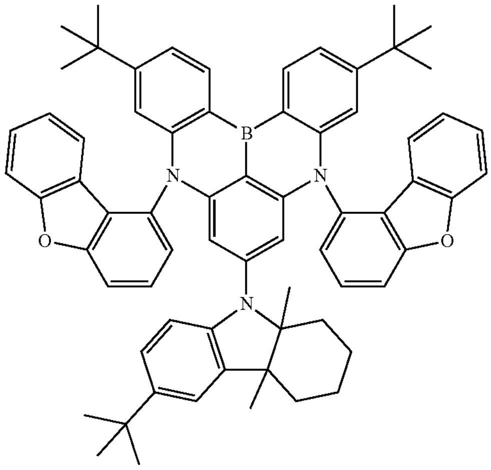
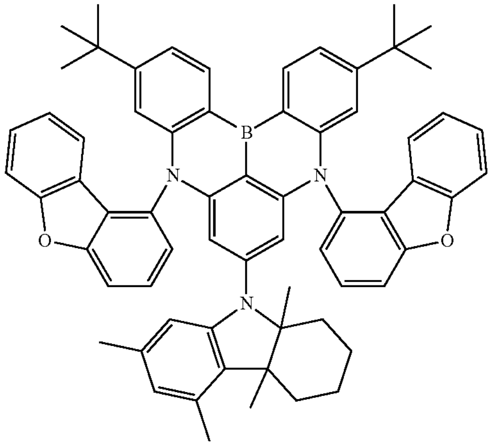
-continued
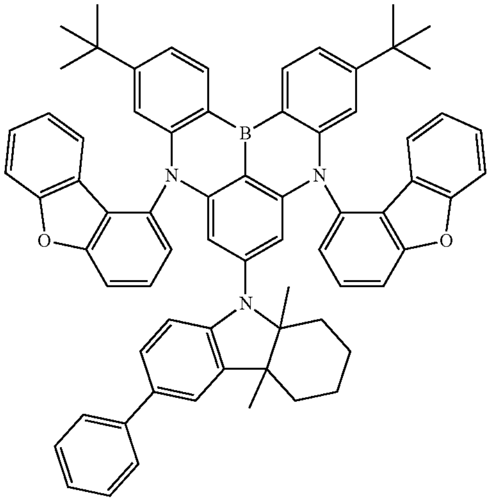
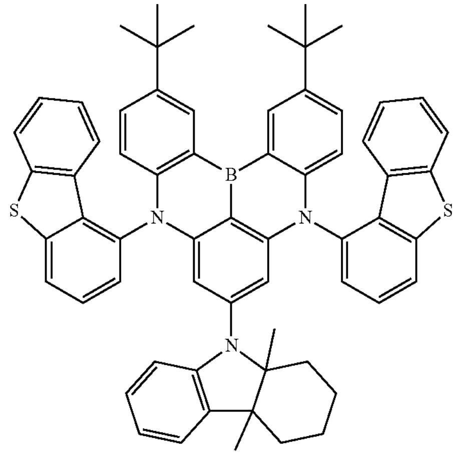
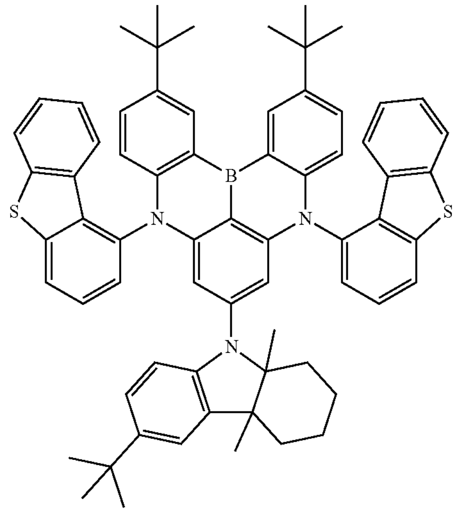

-continued
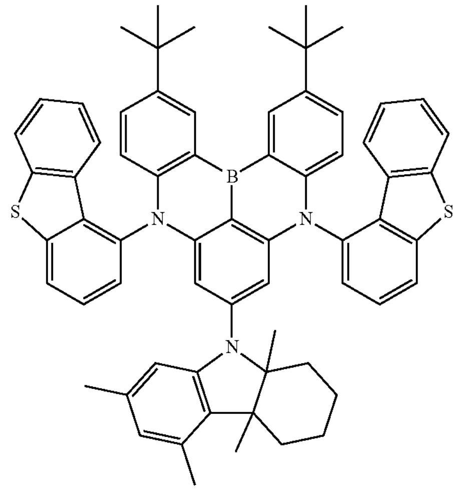
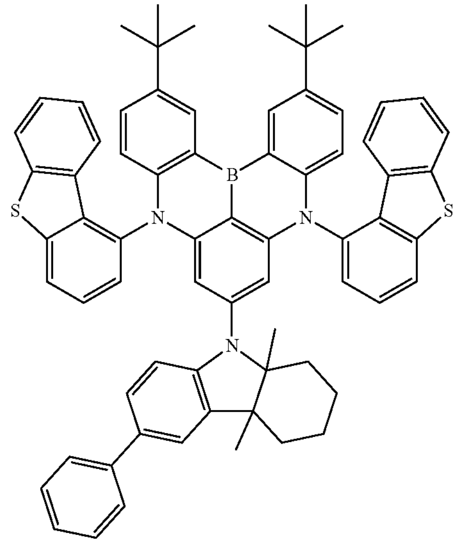
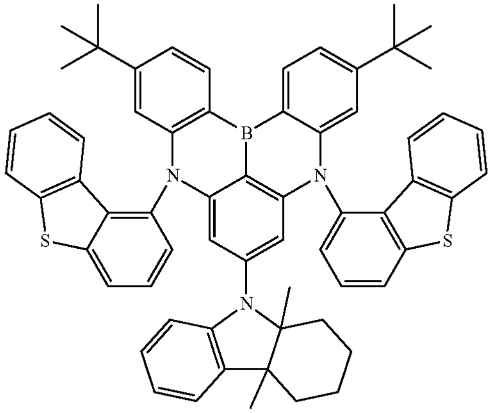
-continued
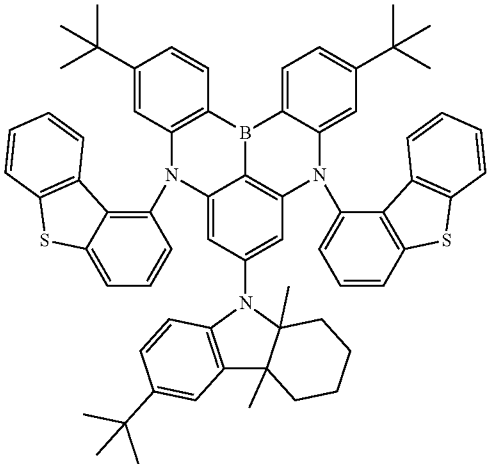
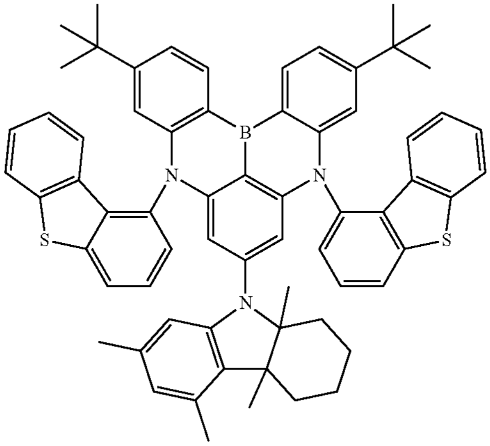
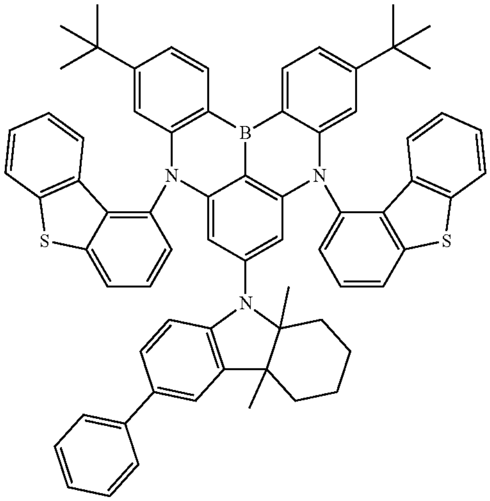

-continued
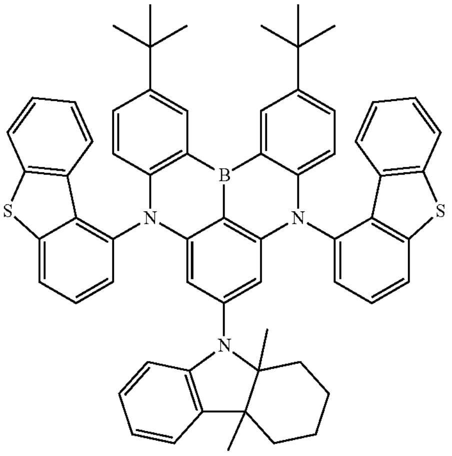
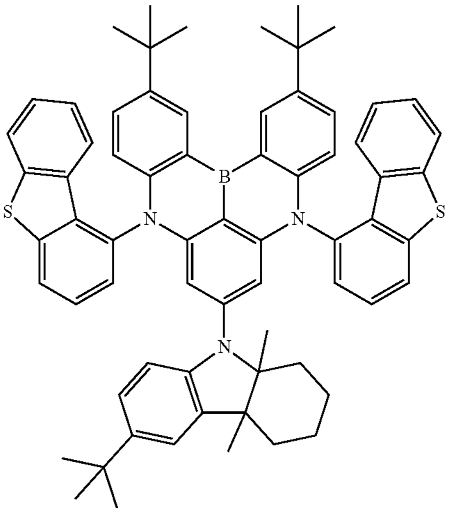
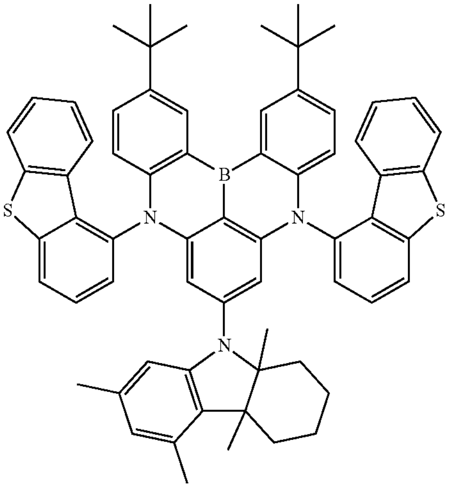
-continued
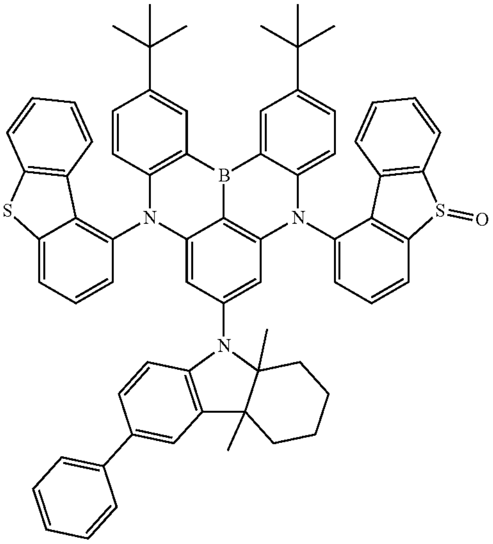
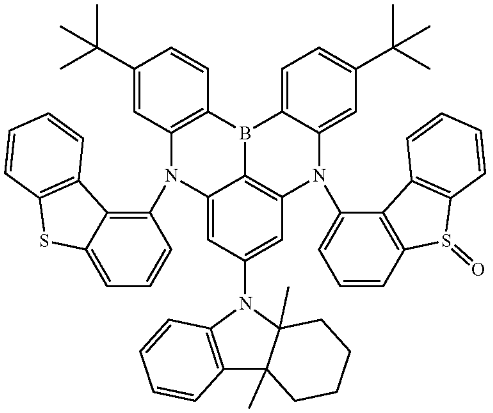
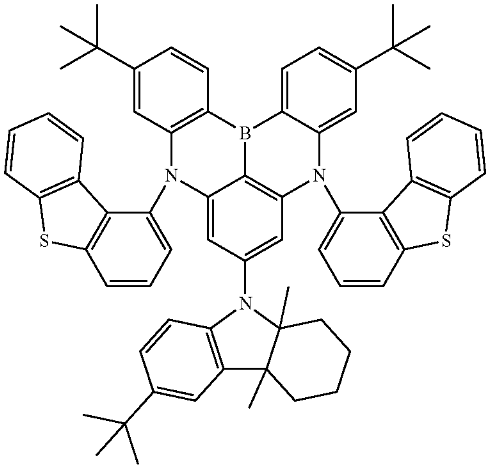

-continued
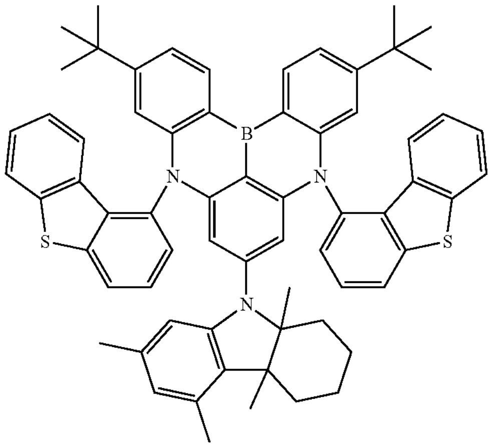
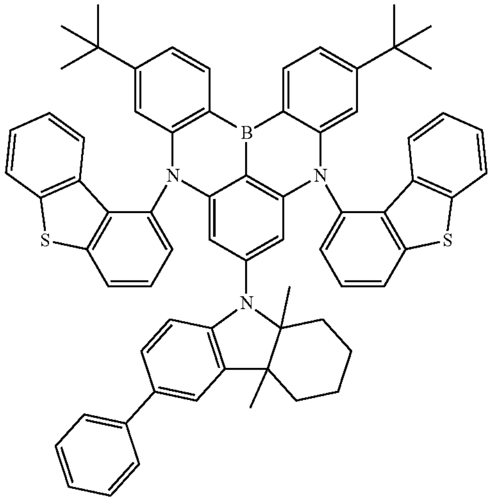
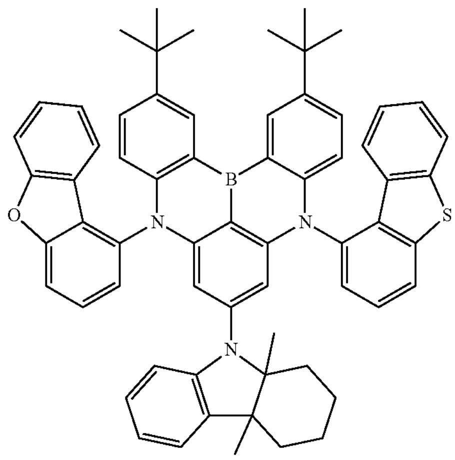
-continued
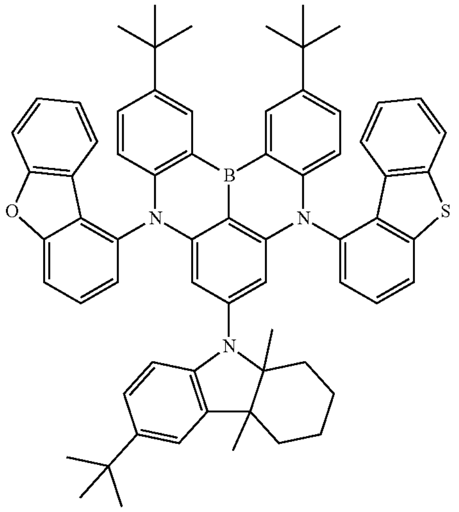
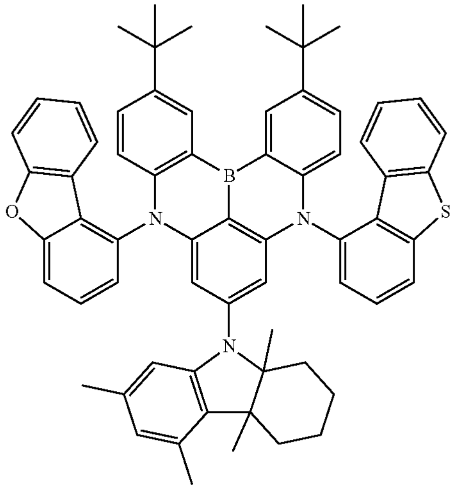
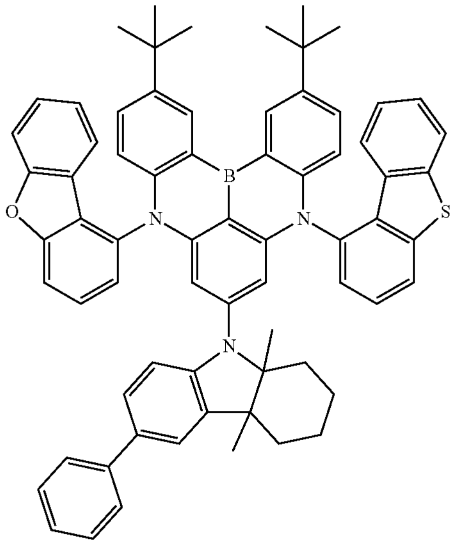

-continued
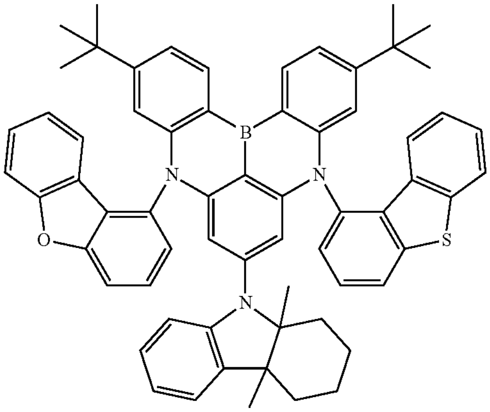
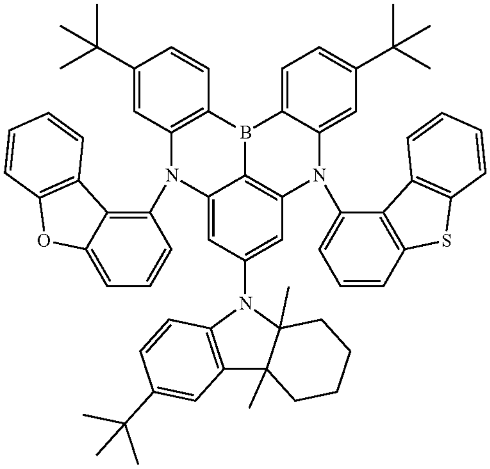
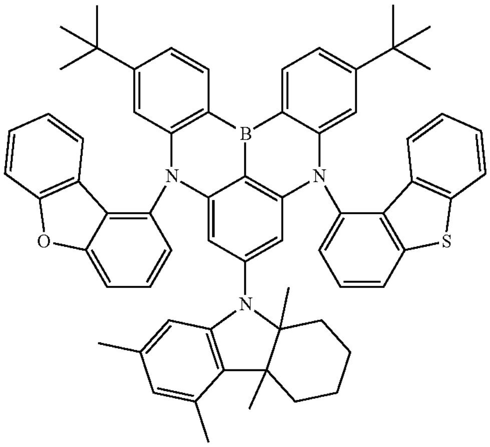
-continued
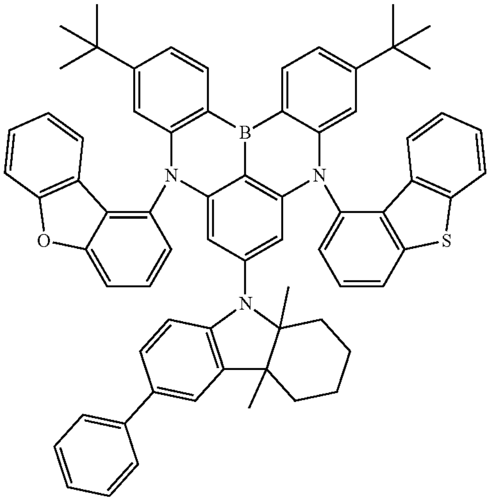
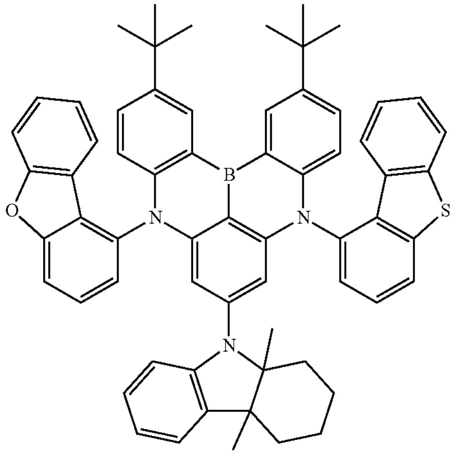
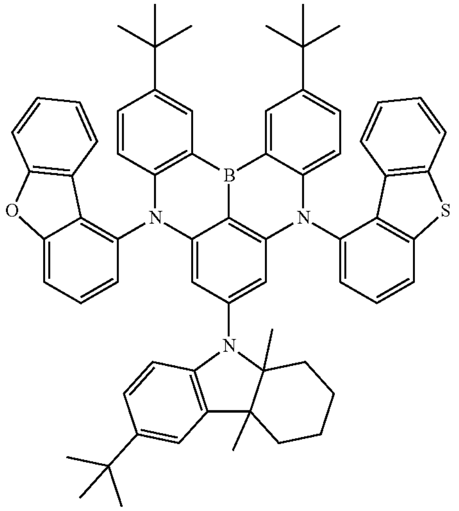

-continued
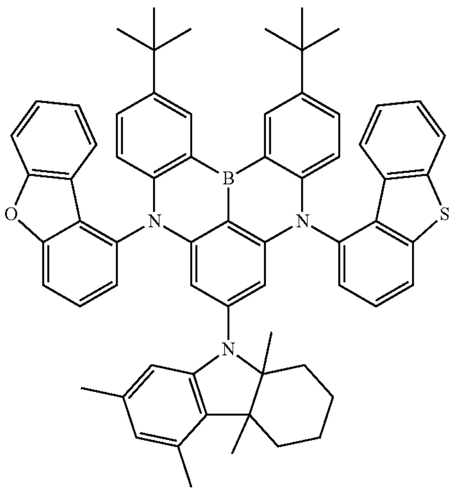
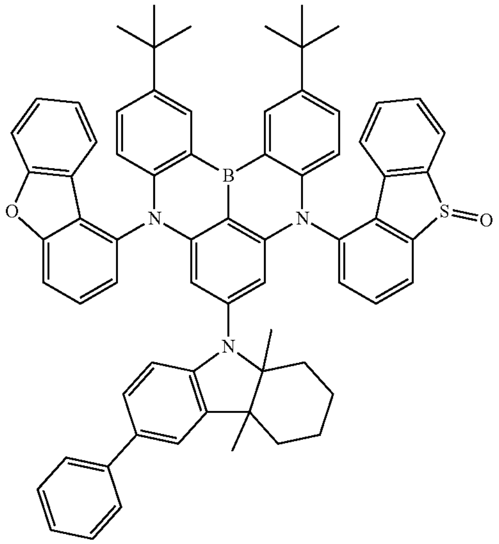
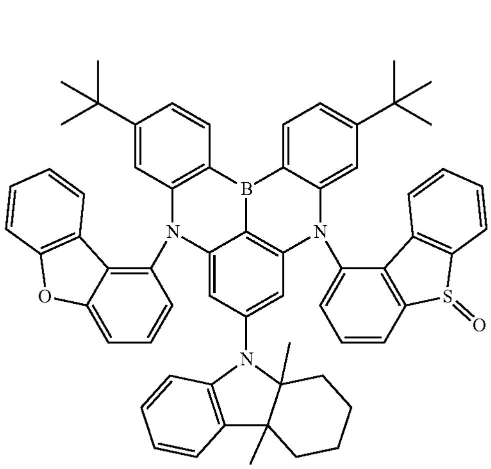
-continued
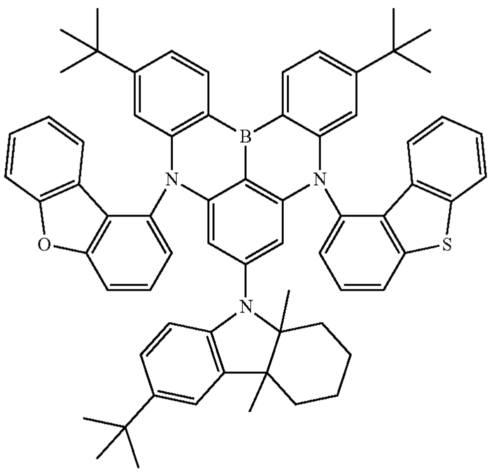
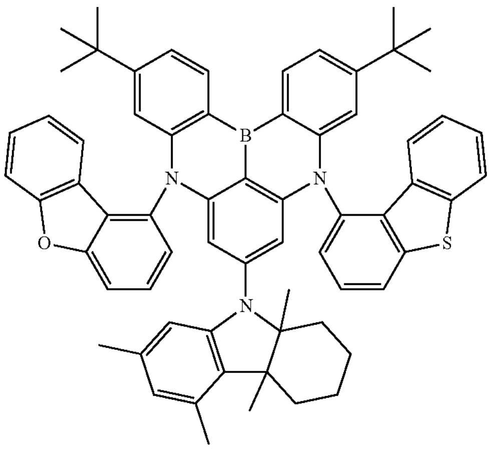
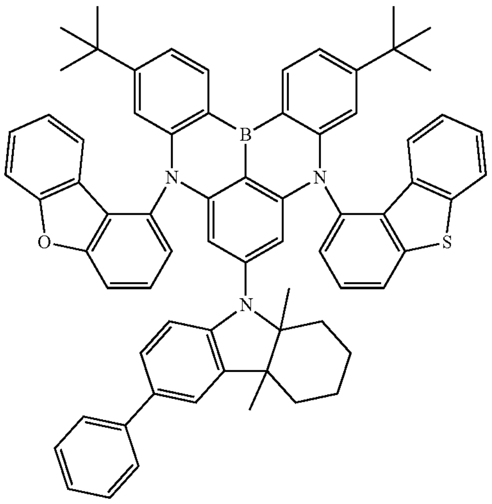

-continued
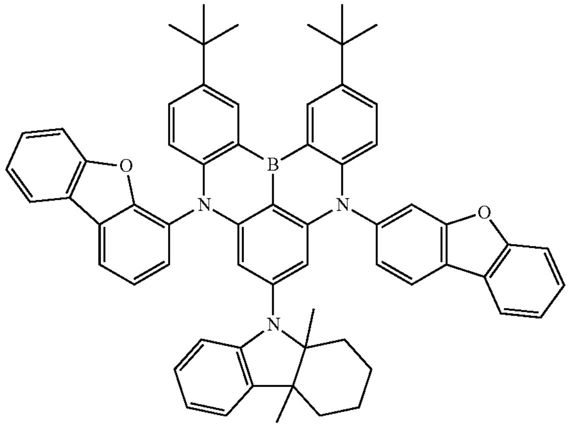
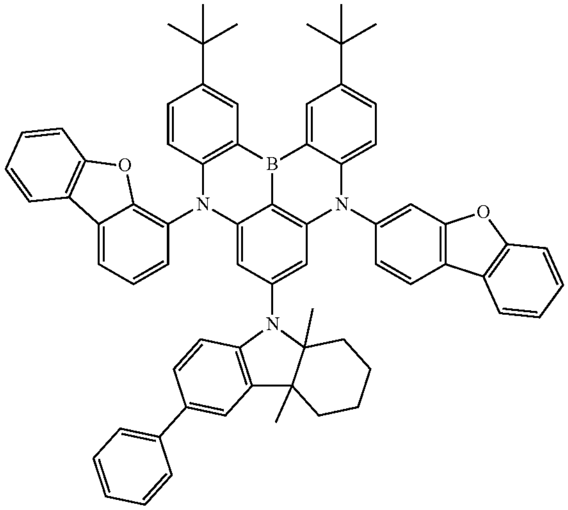
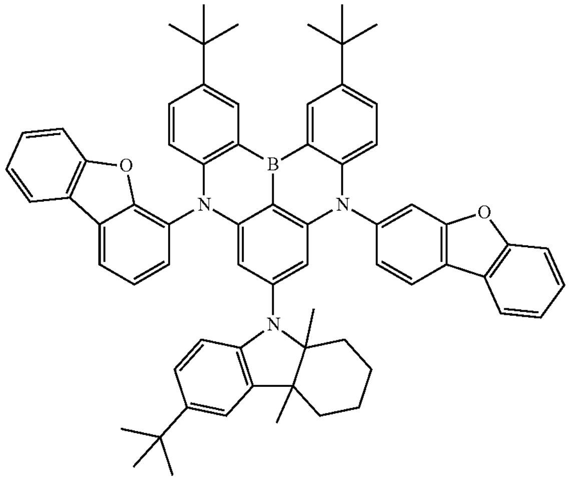
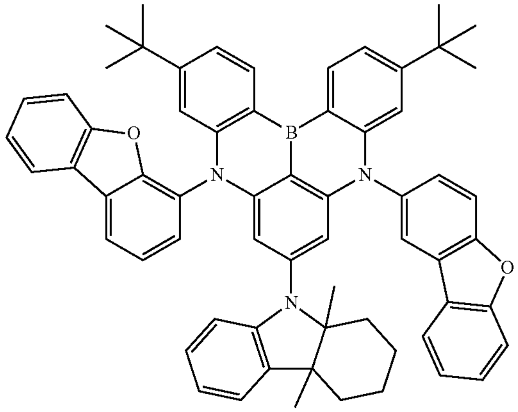
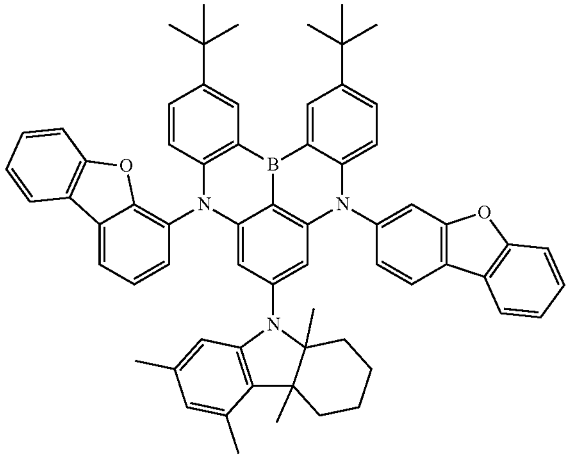
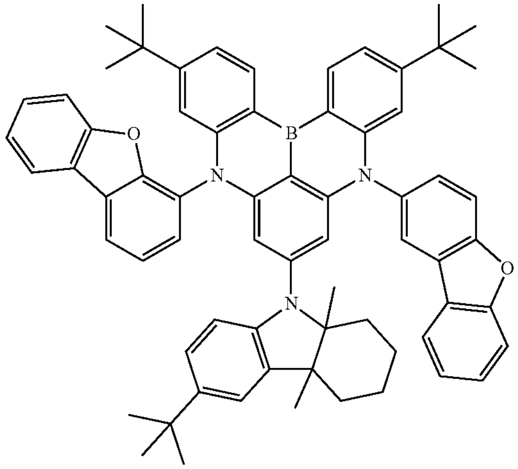

-continued
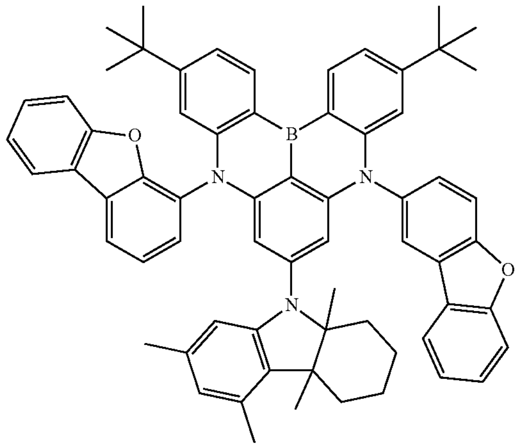
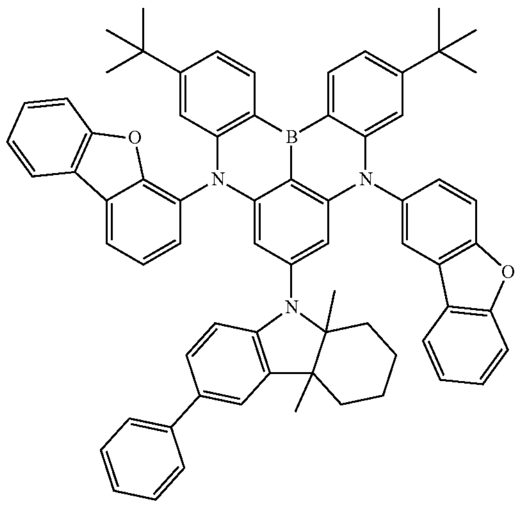
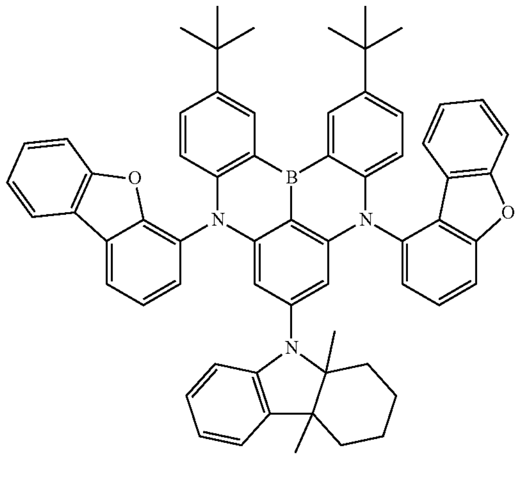
-continued
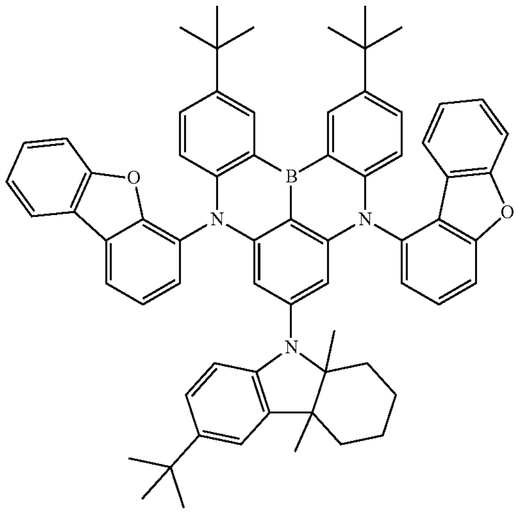
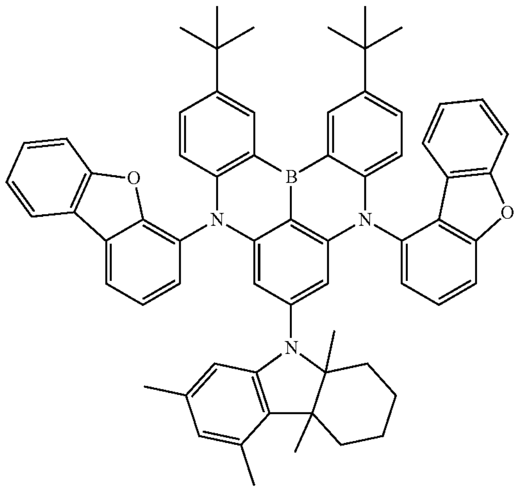
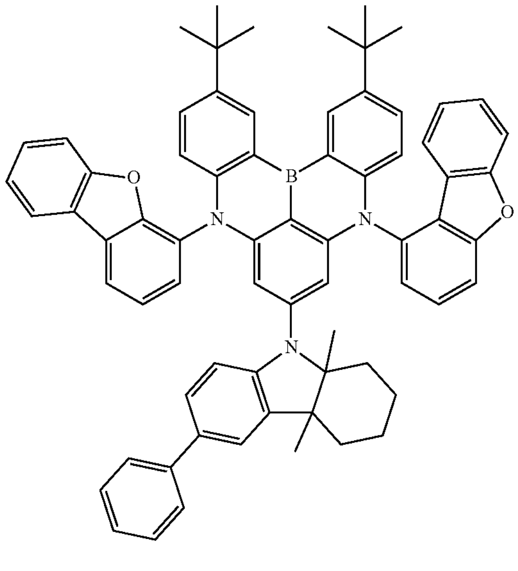

-continued
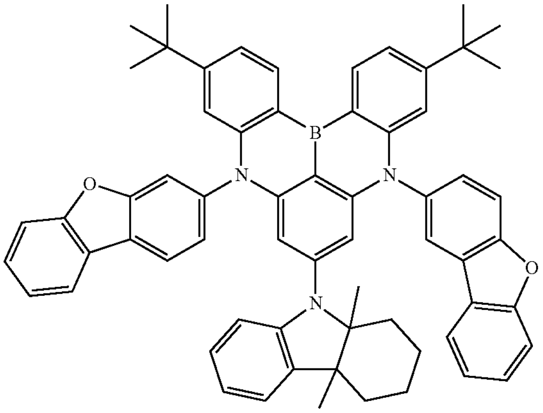
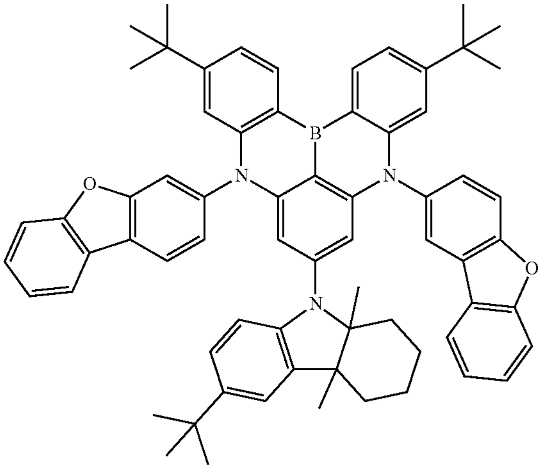
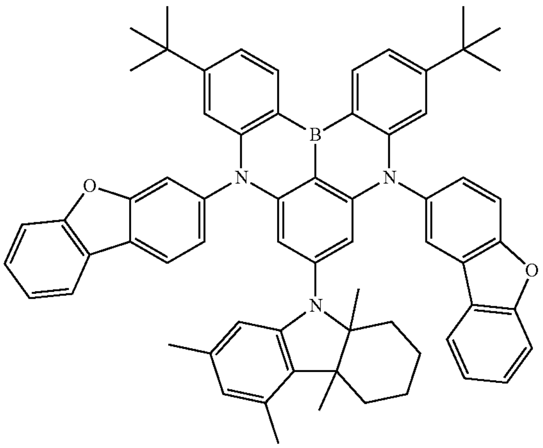
-continued
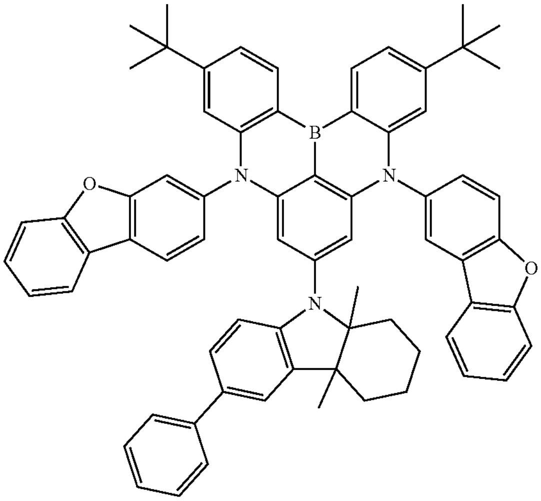
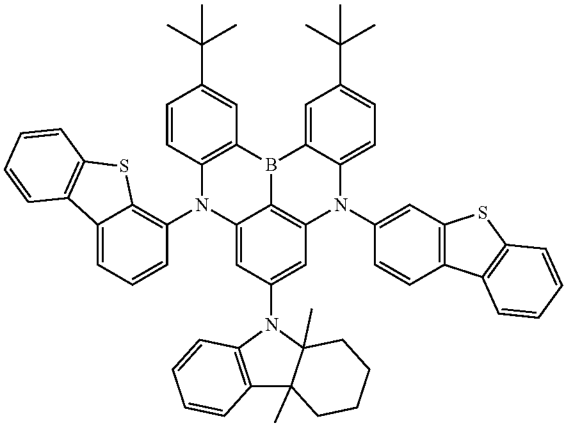
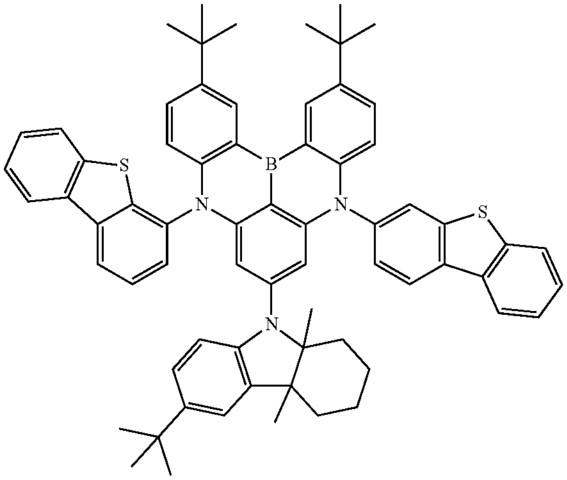

-continued
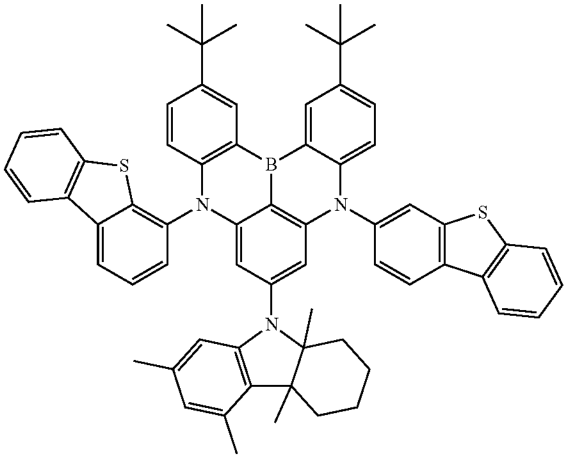
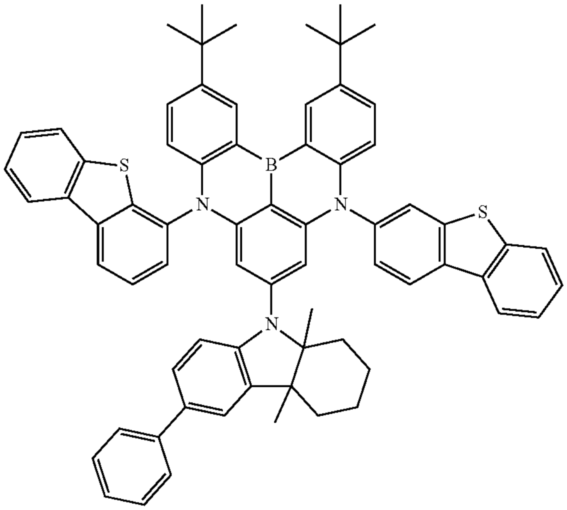
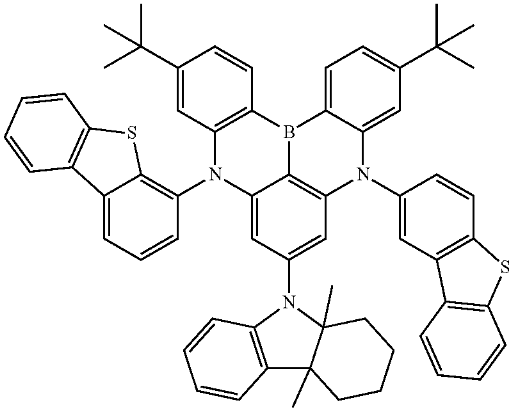
-continued
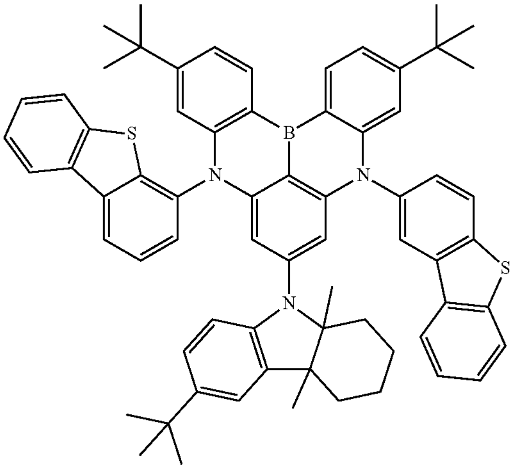
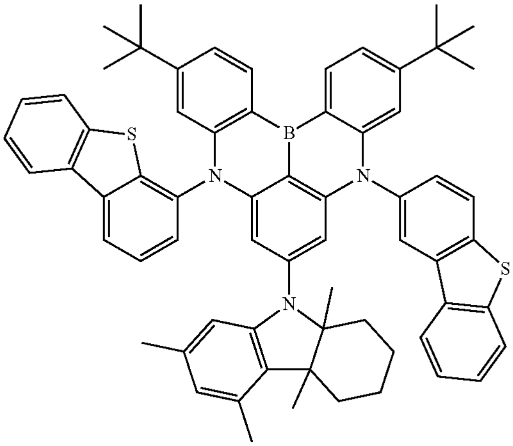
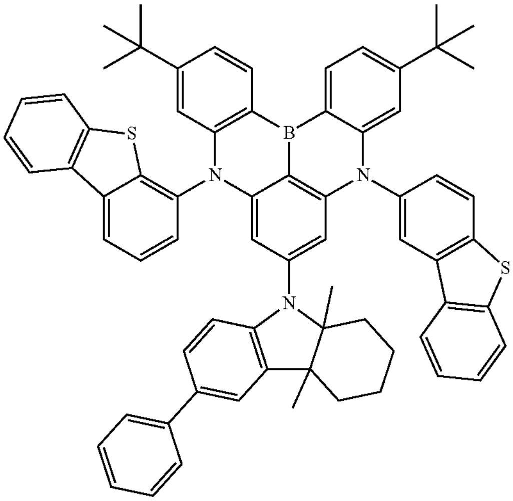

-continued
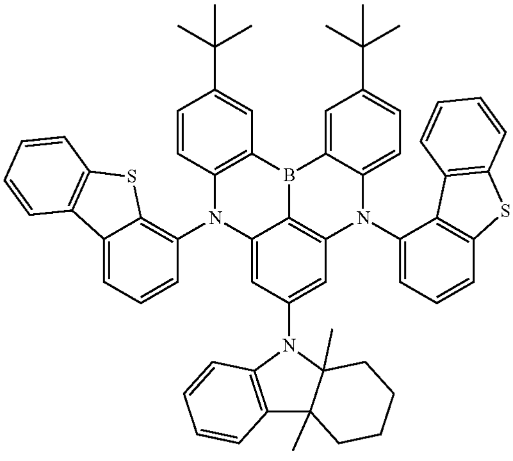
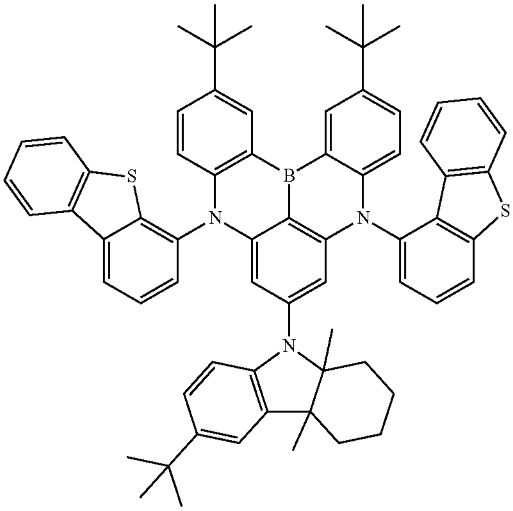
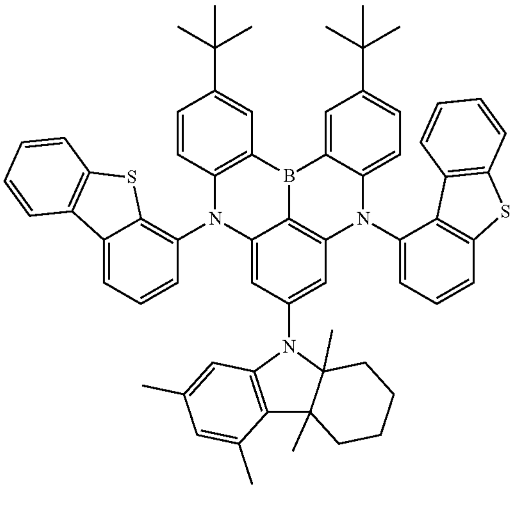
-continued
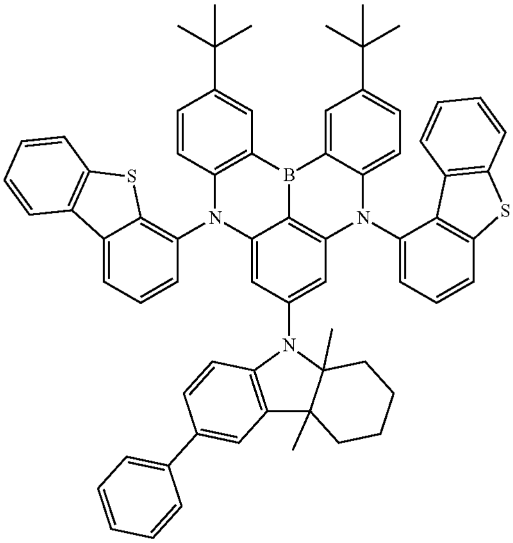
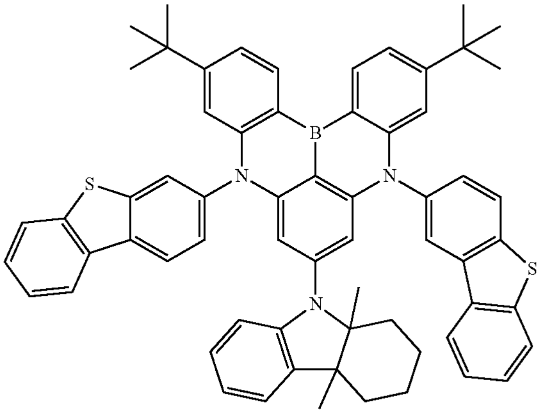
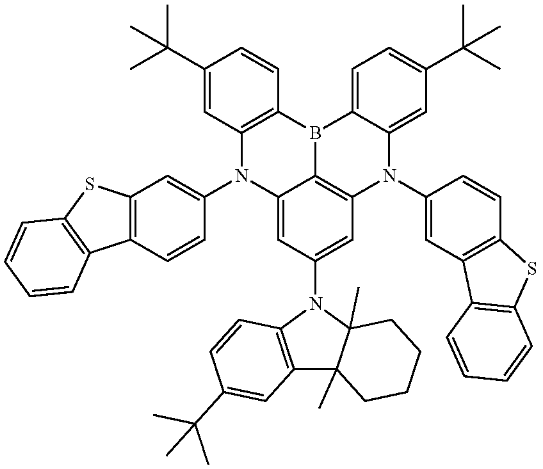

-continued
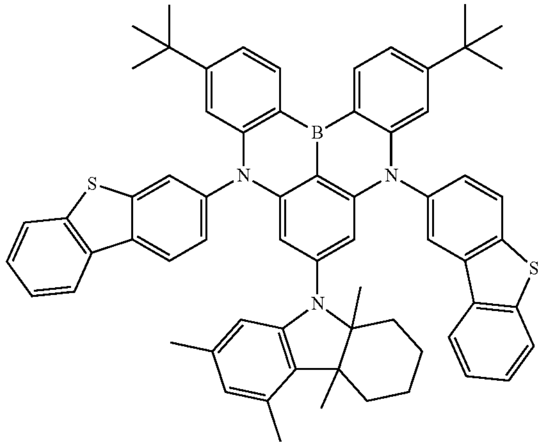
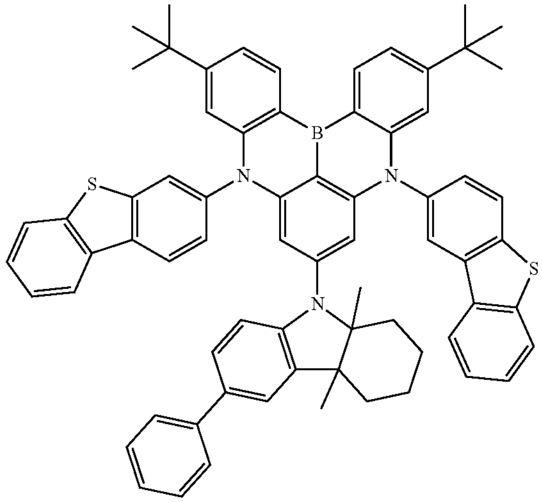
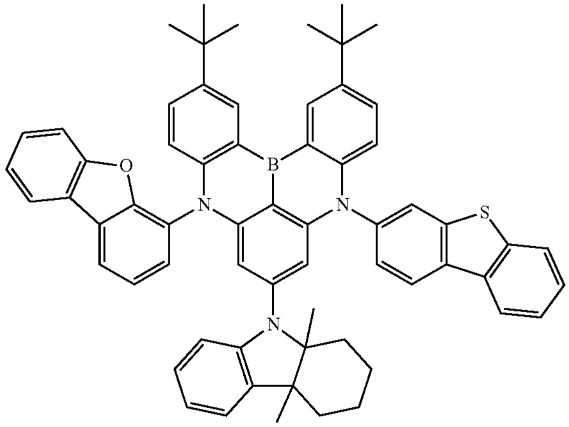
-continued
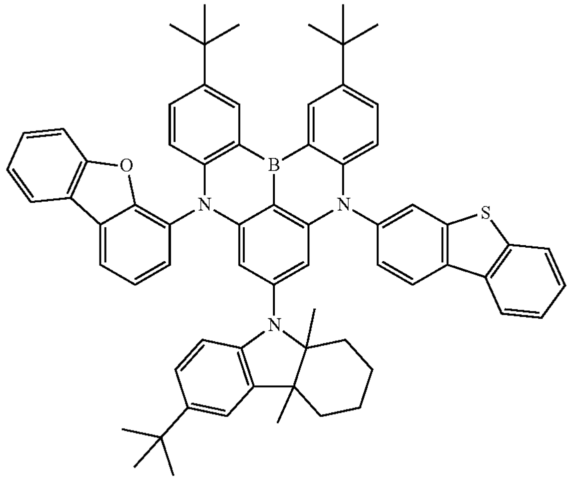
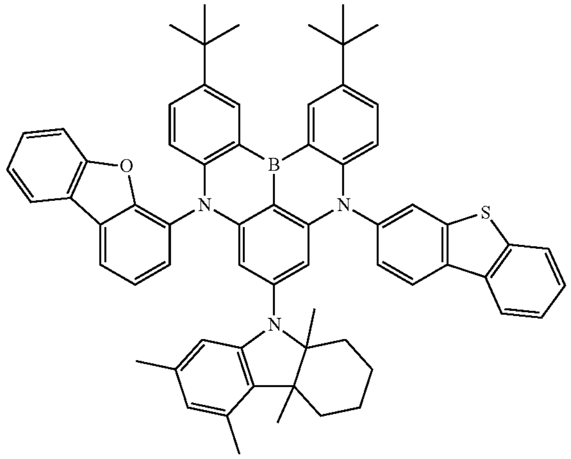
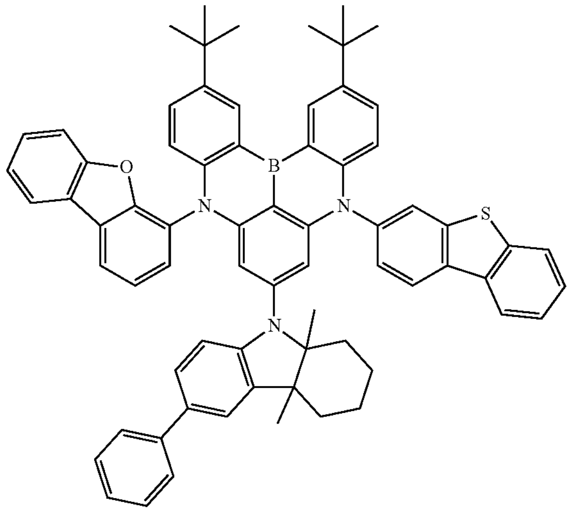

-continued
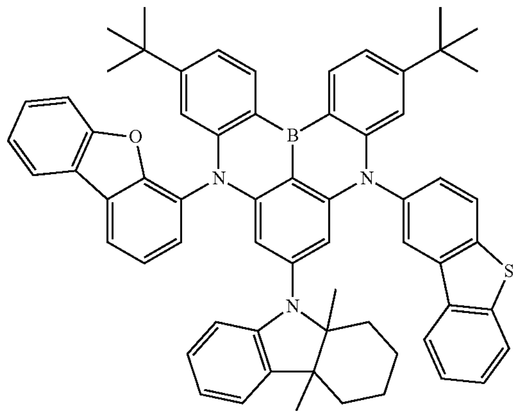
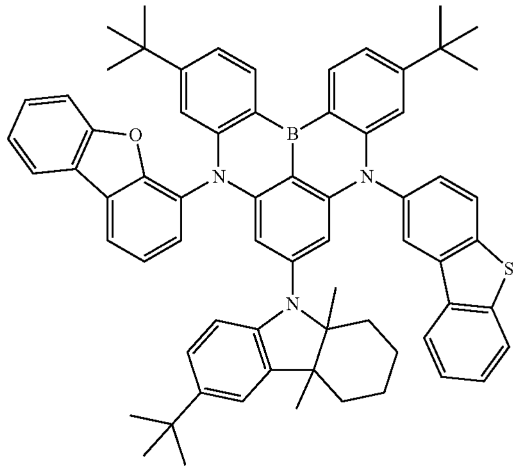
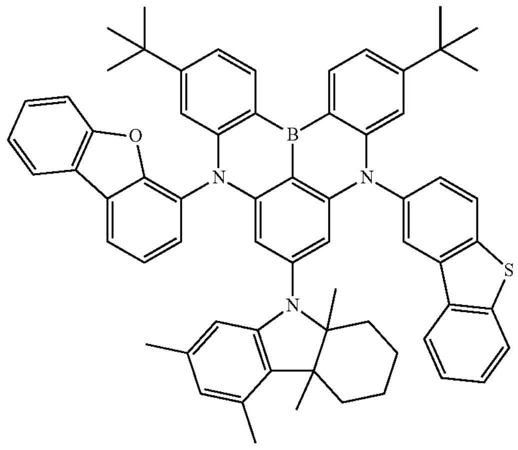
-continued
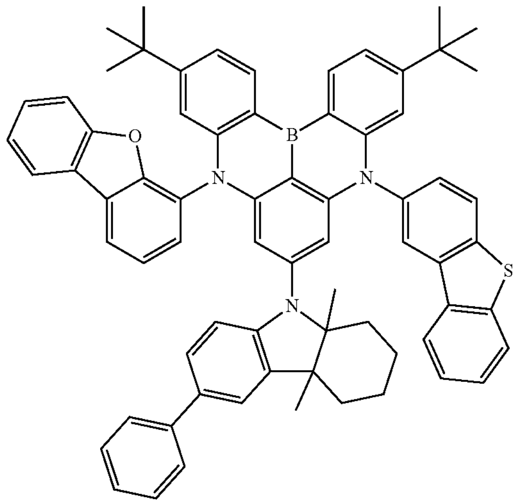
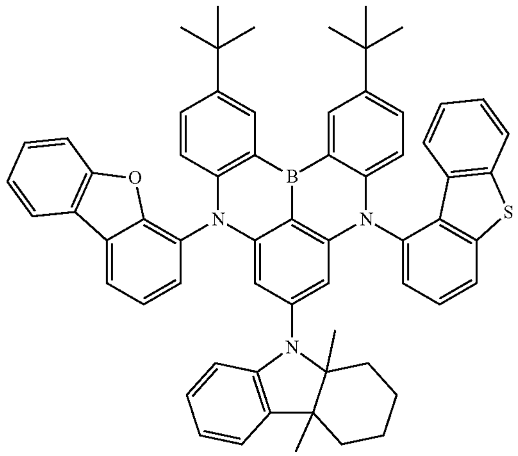
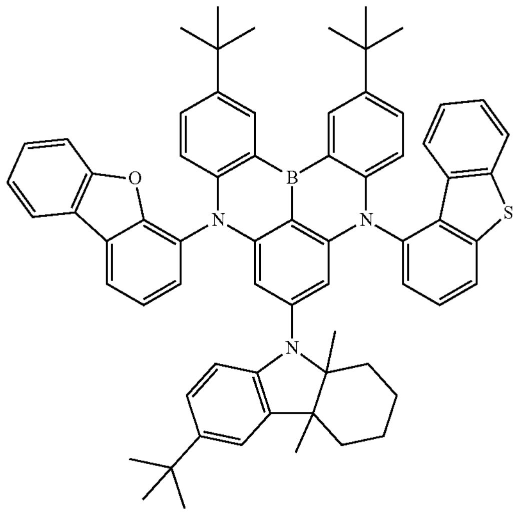

-continued
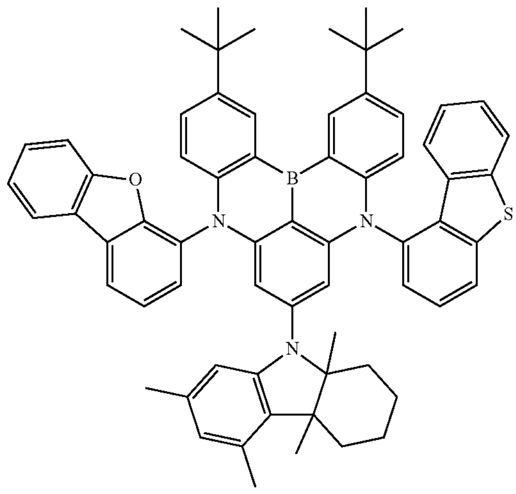
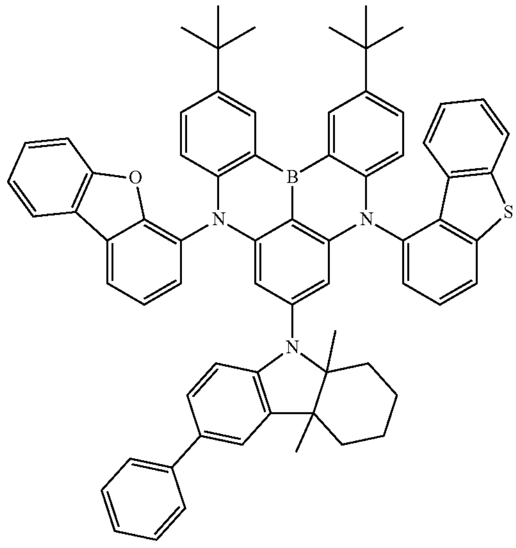
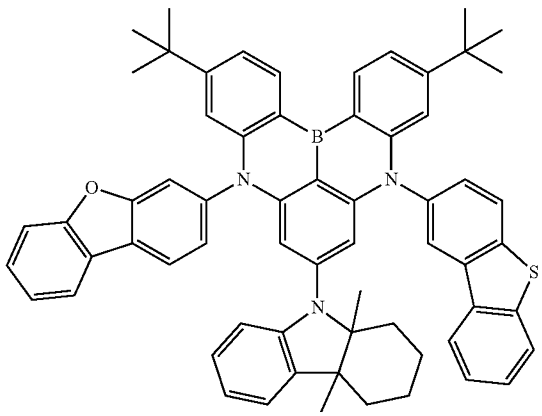
-continued
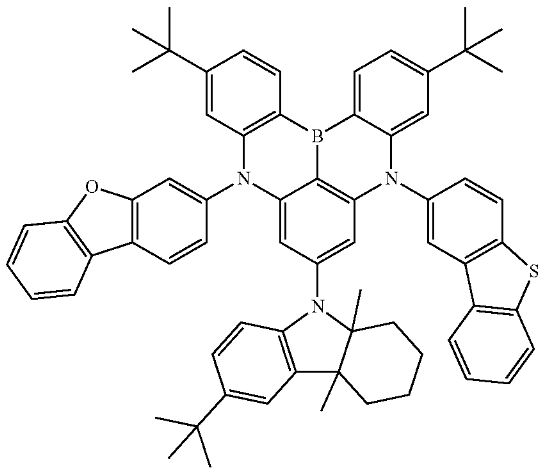
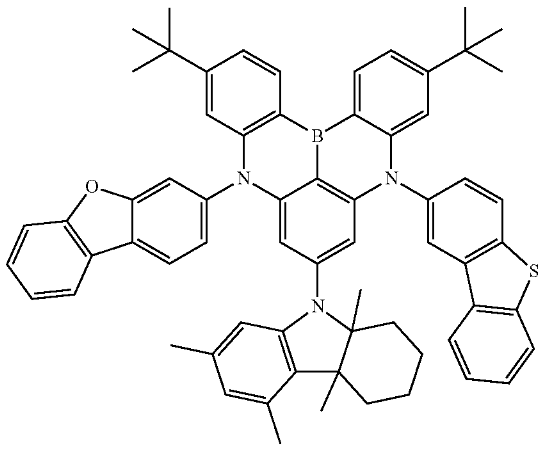
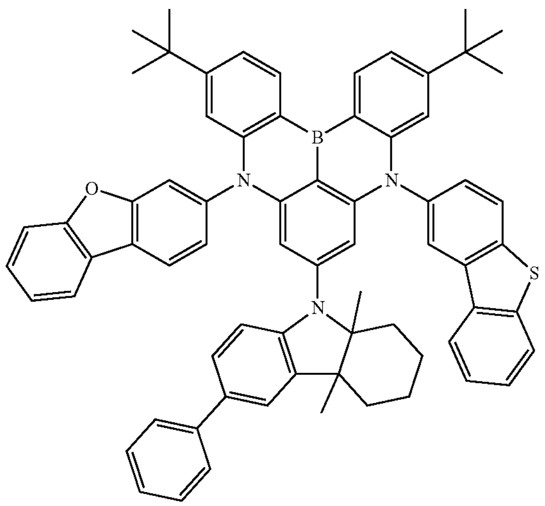

-continued
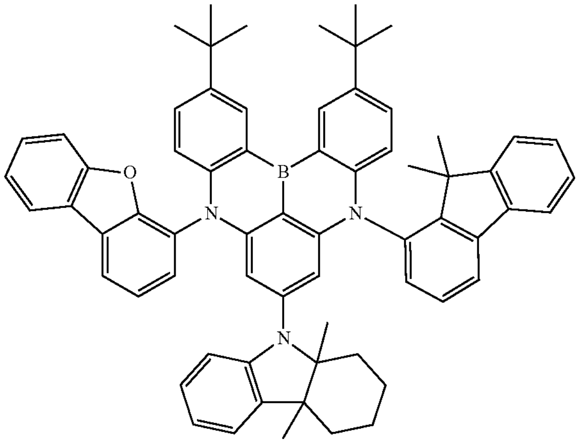
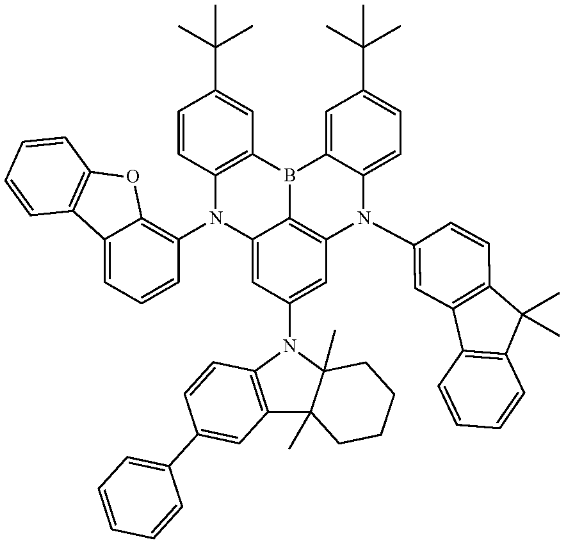
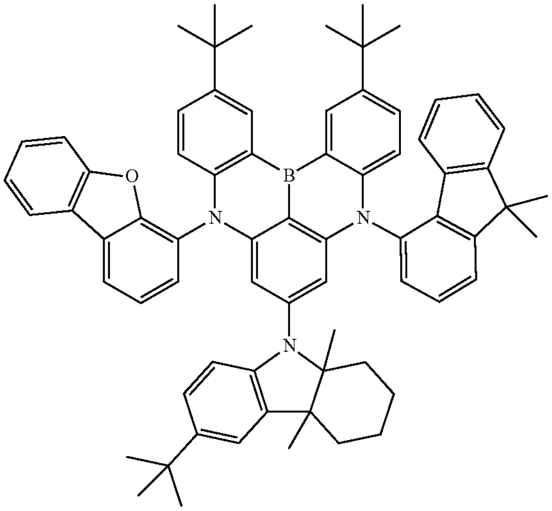
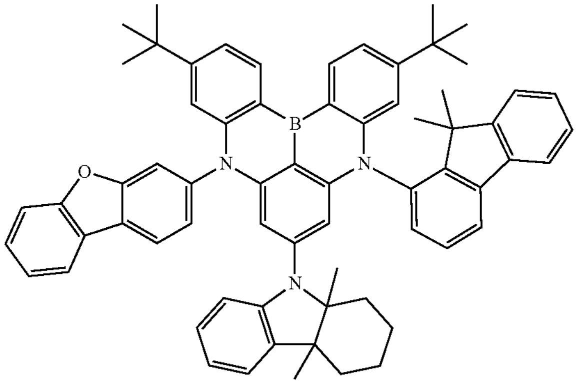
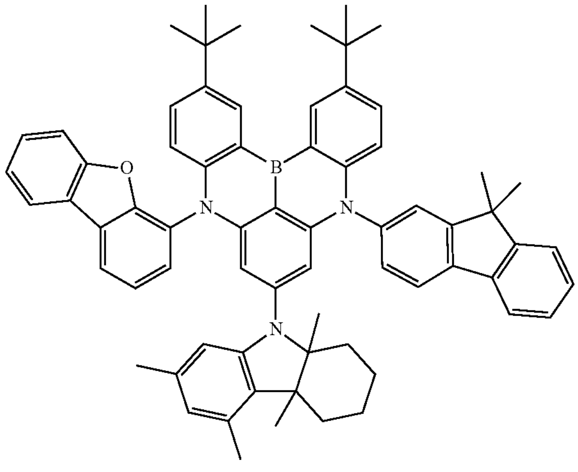
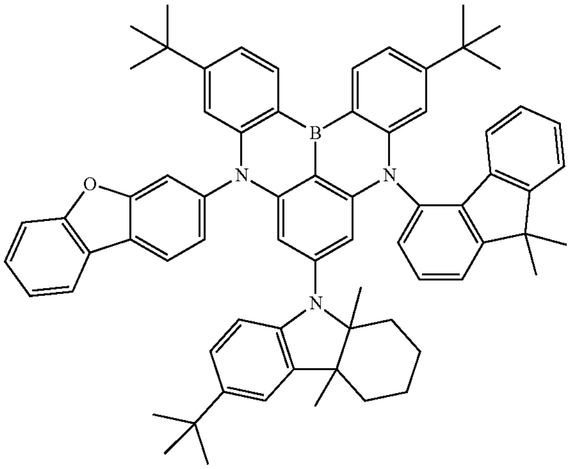

-continued
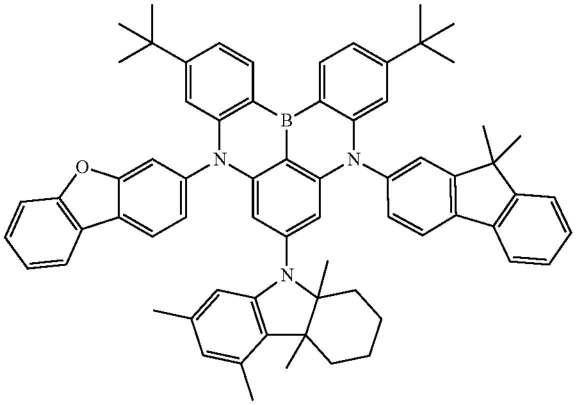
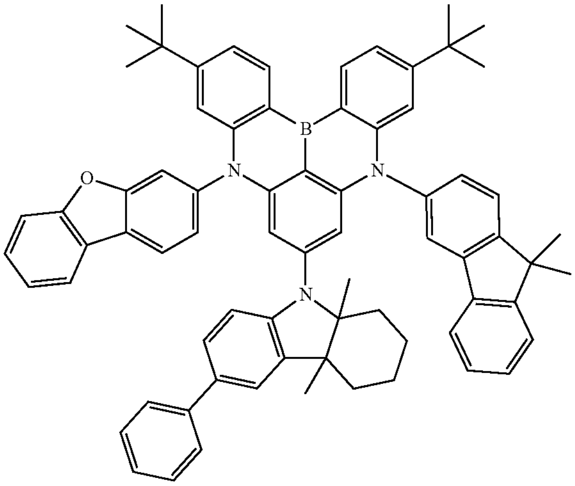
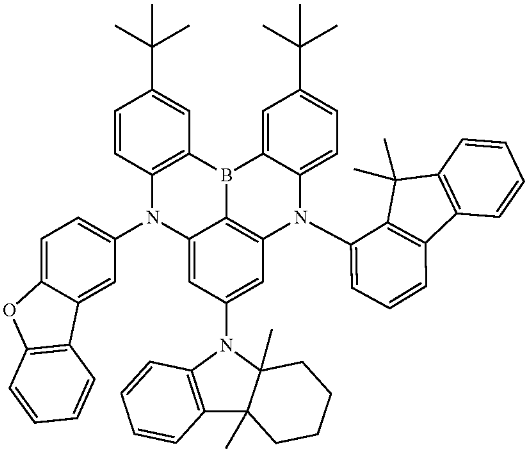
-continued
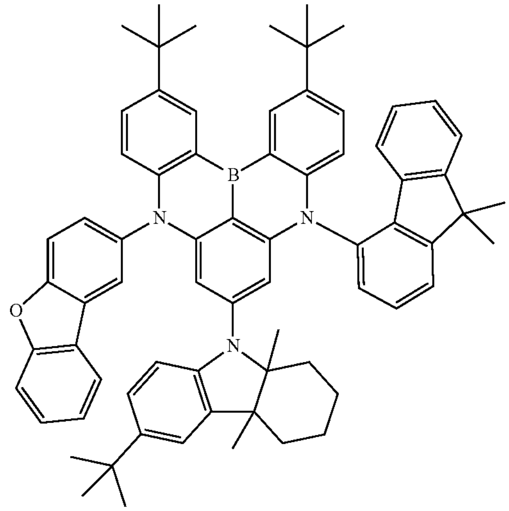
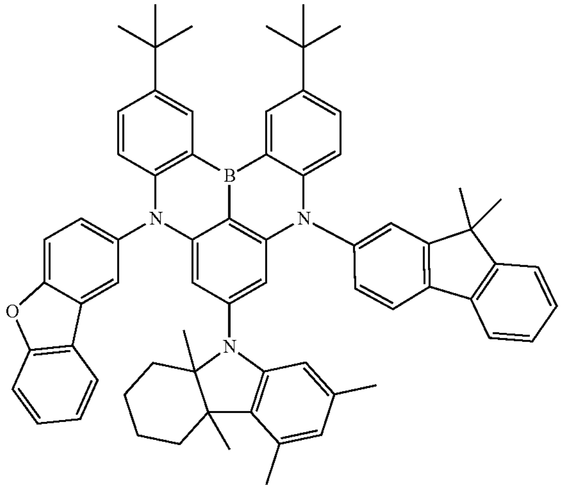
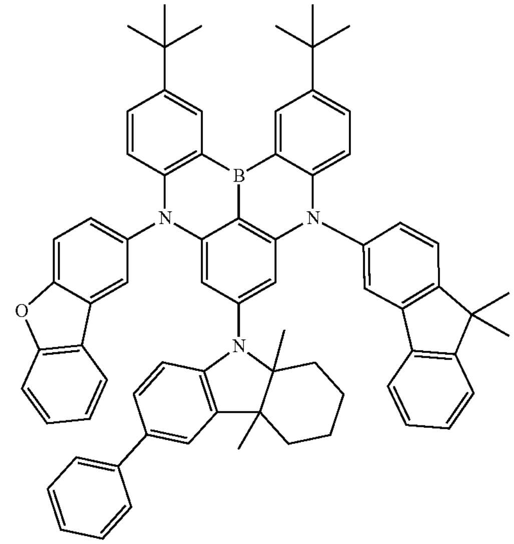

-continued
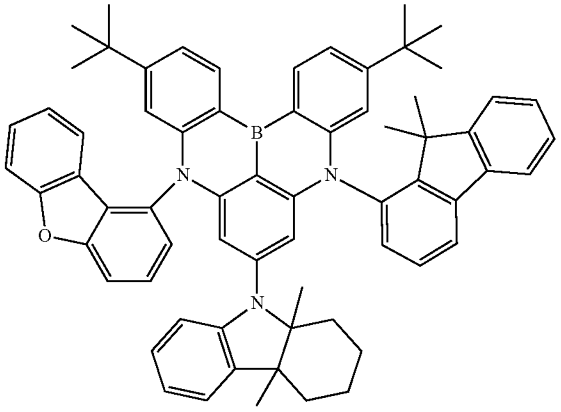
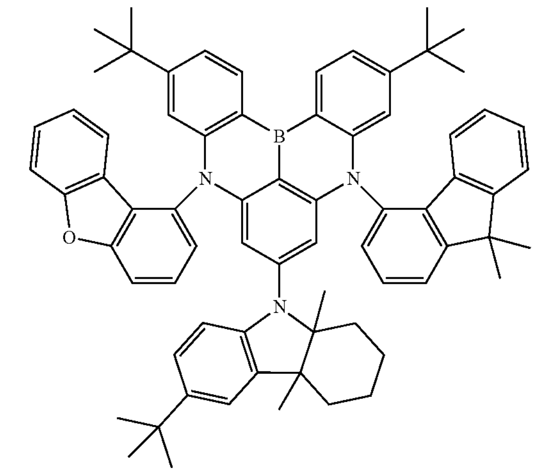
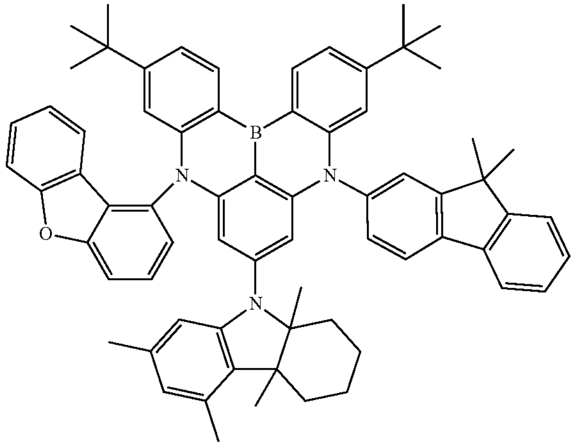
-continued
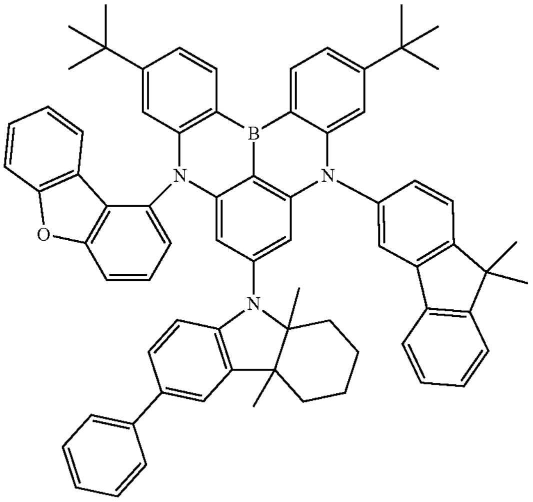
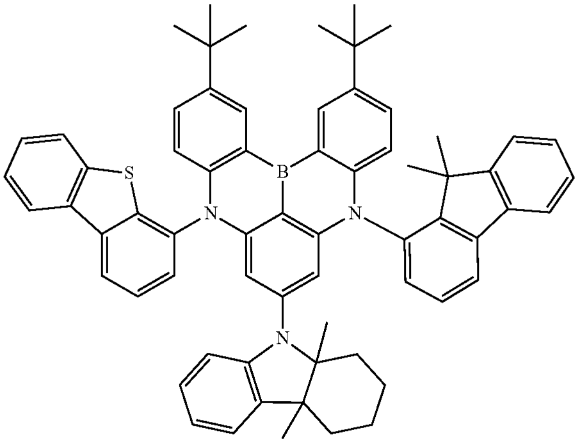
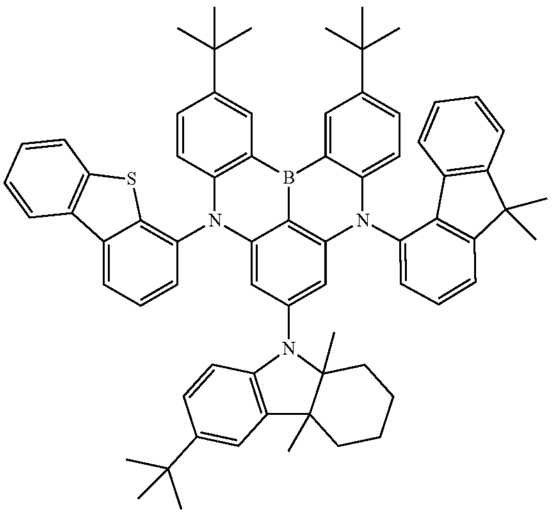

-continued
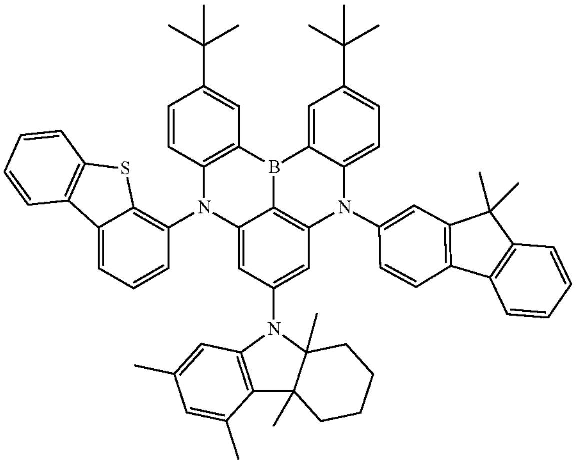
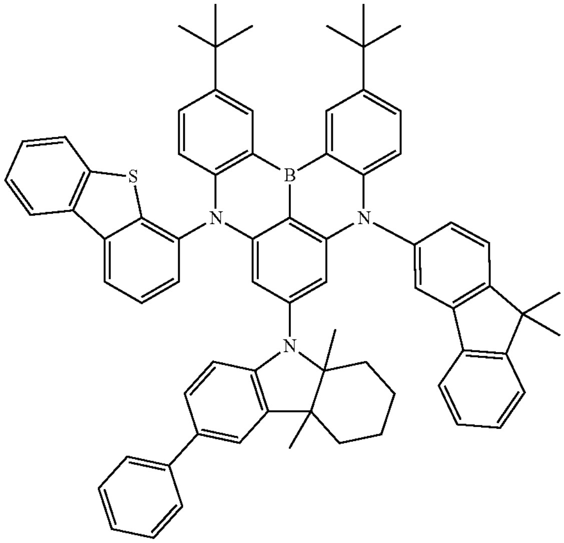
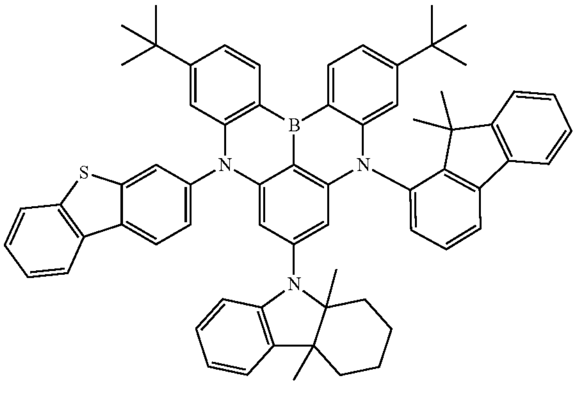
-continued
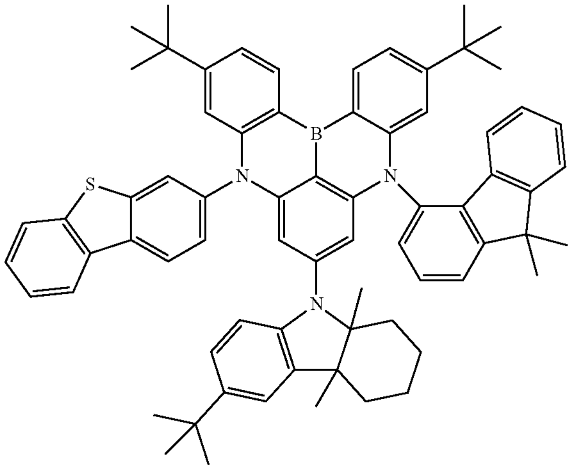
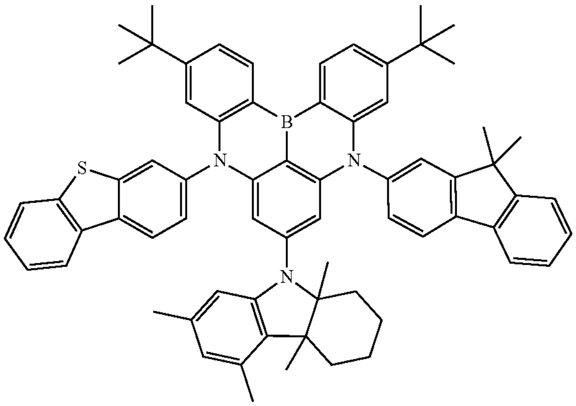
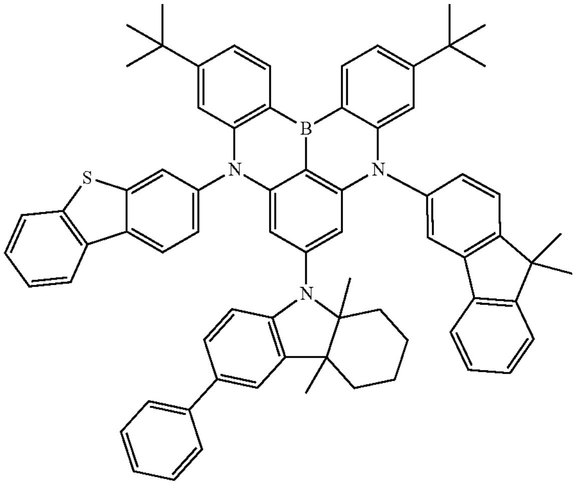

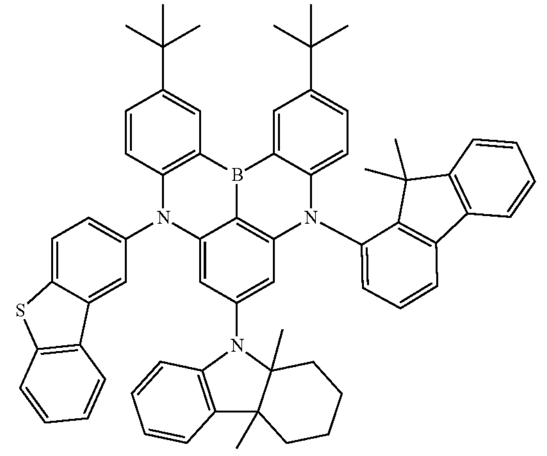
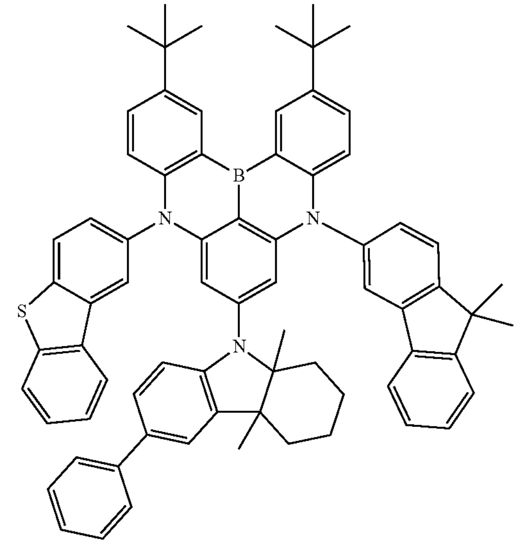
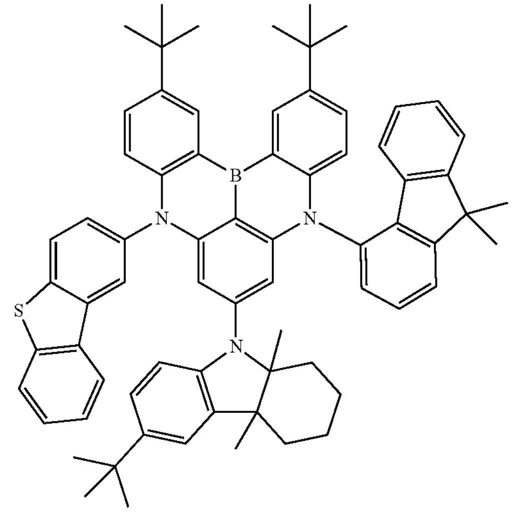
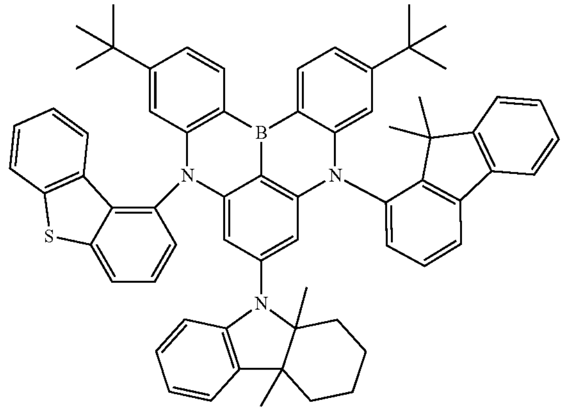
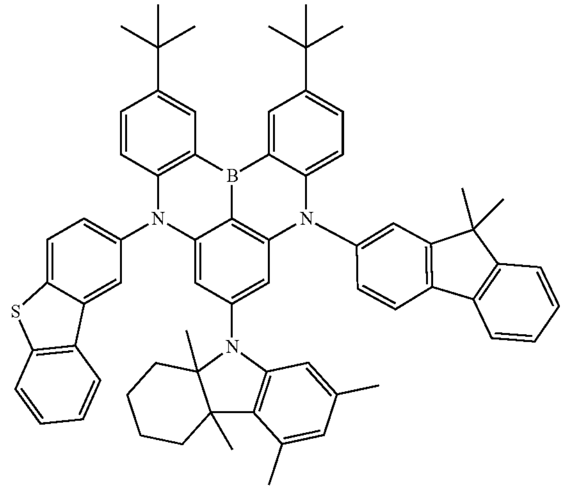
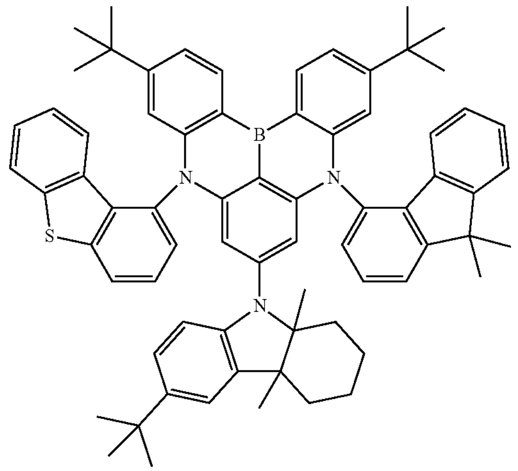

-continued
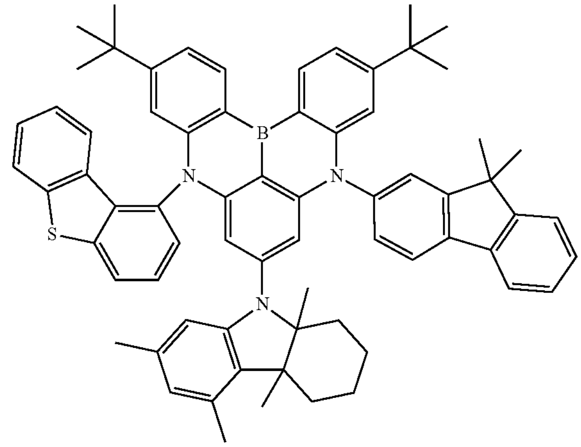
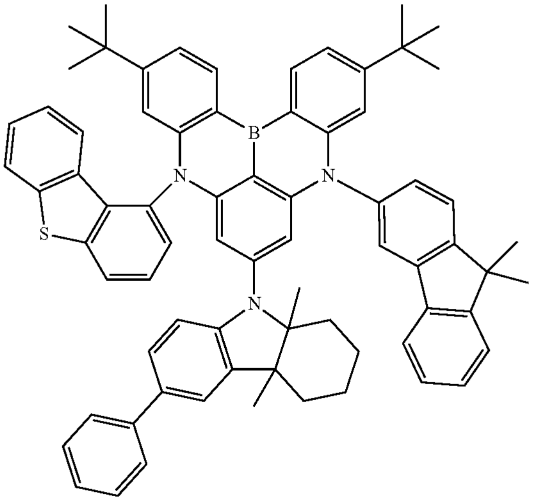
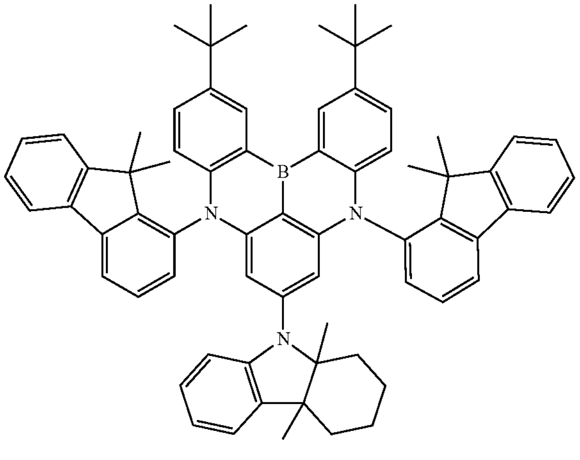
-continued
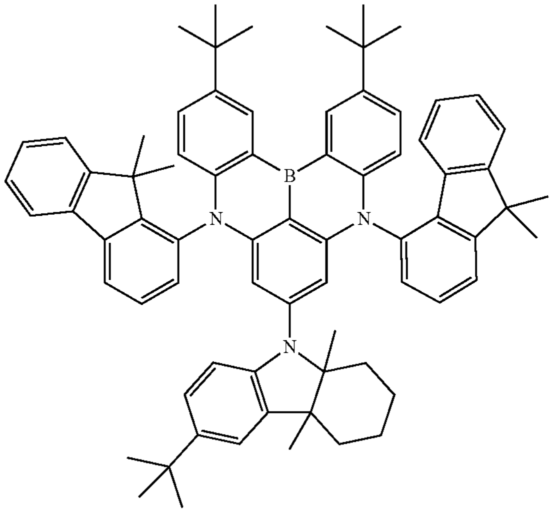
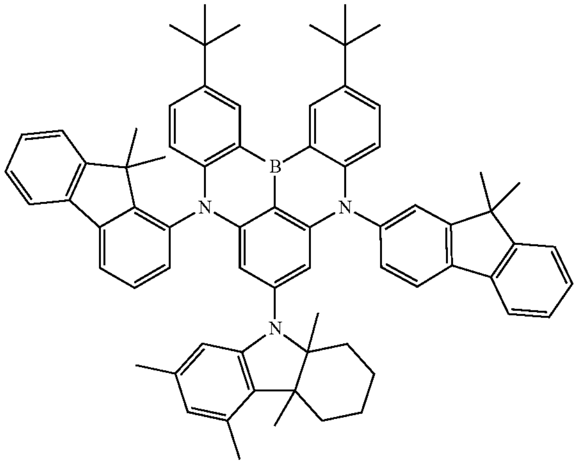
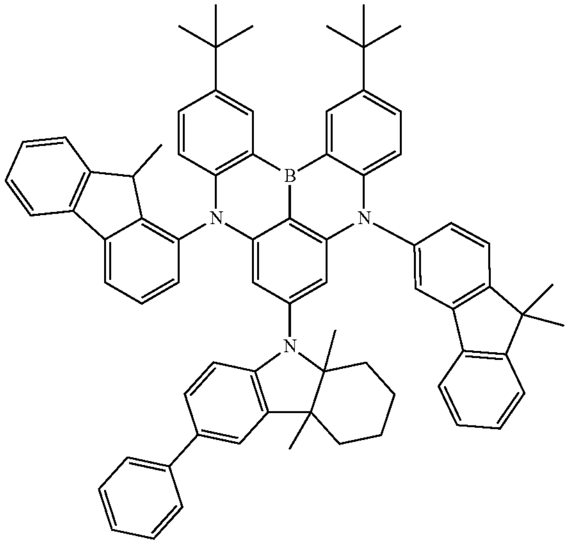

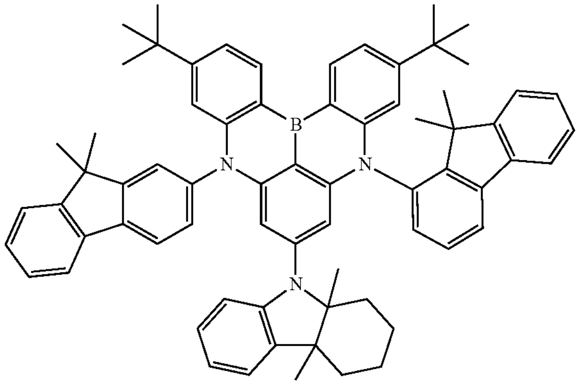
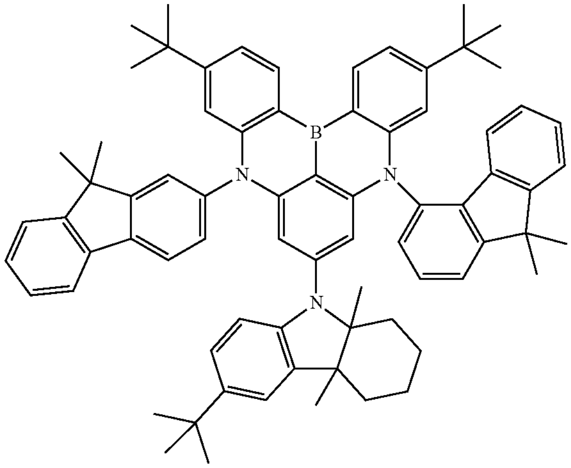
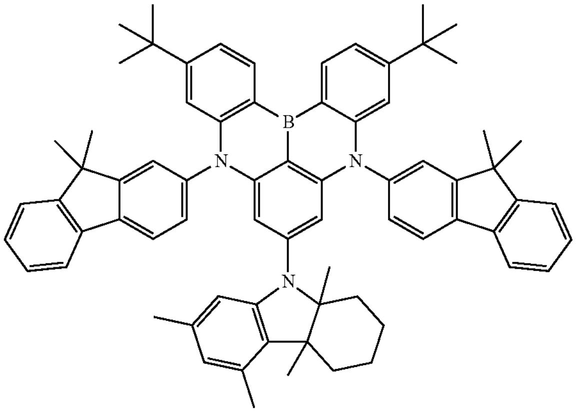
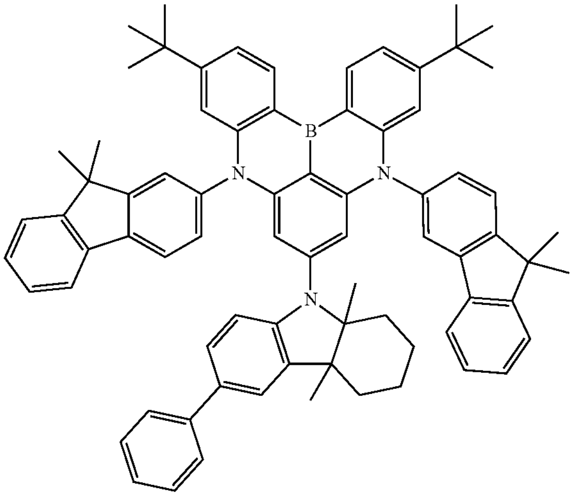
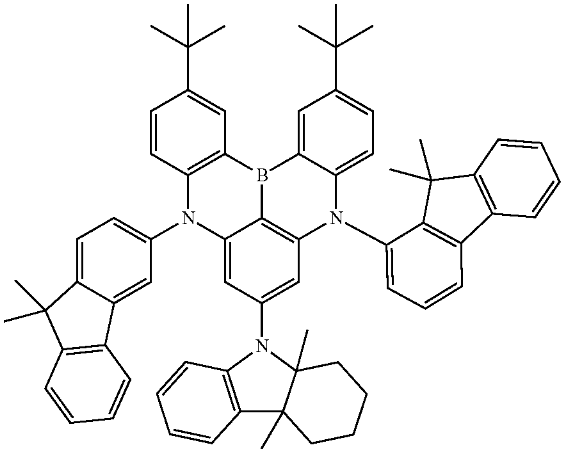
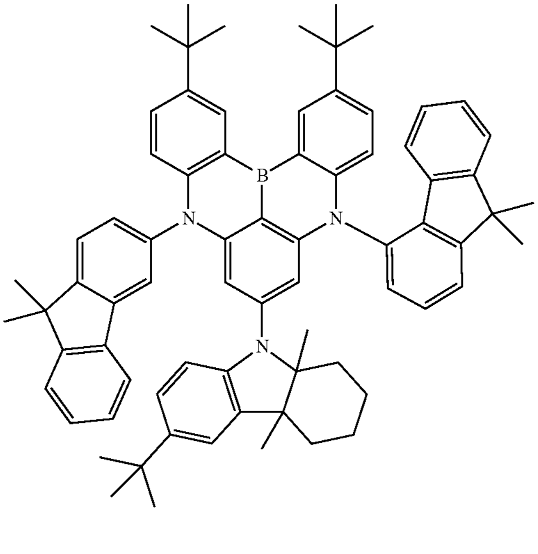

-continued
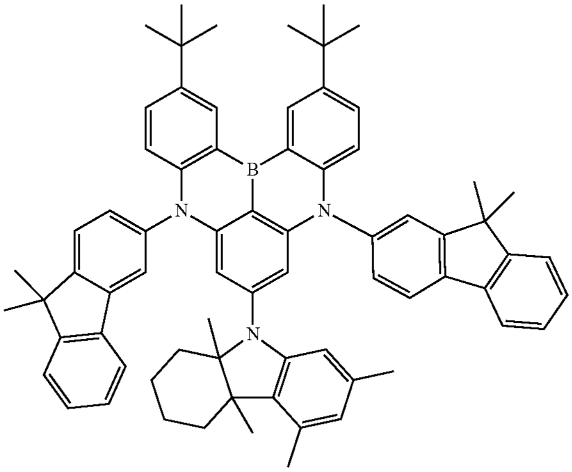
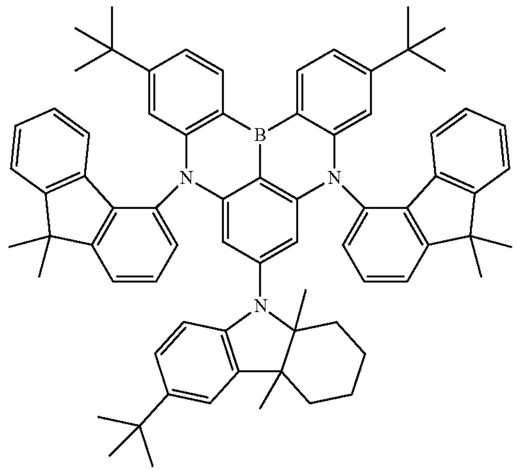
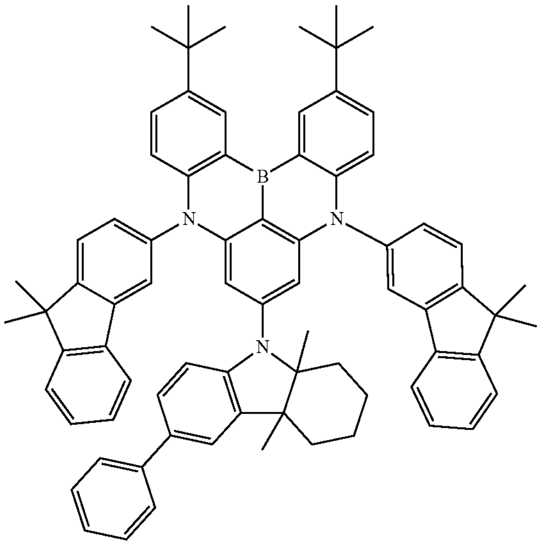
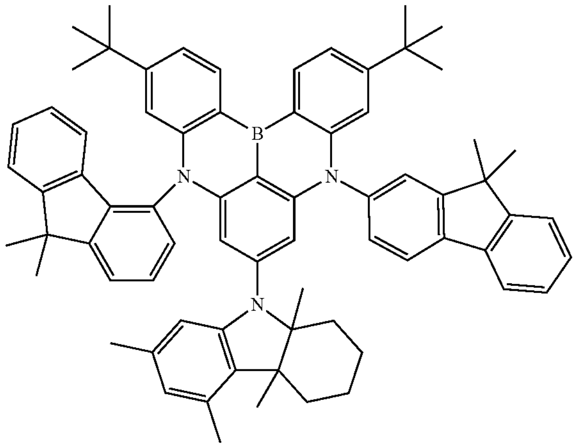
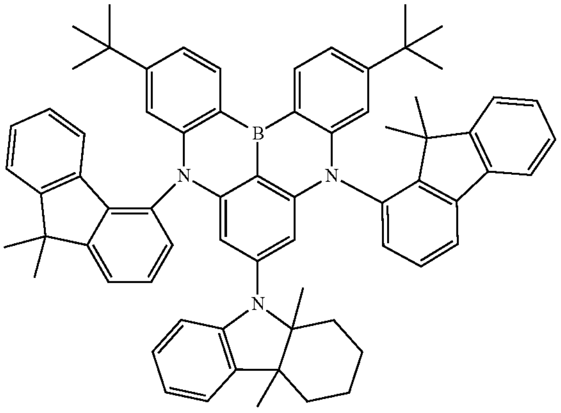
-continued
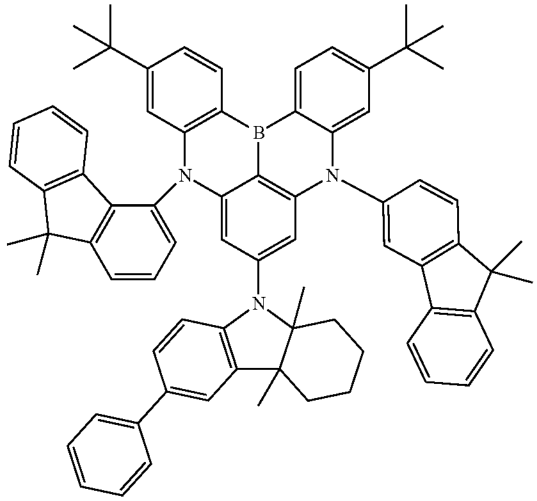

-continued
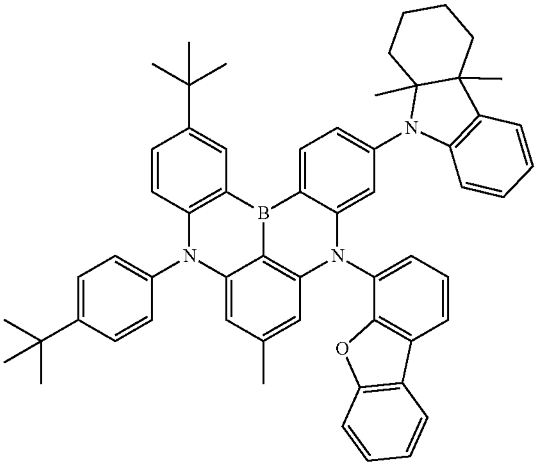
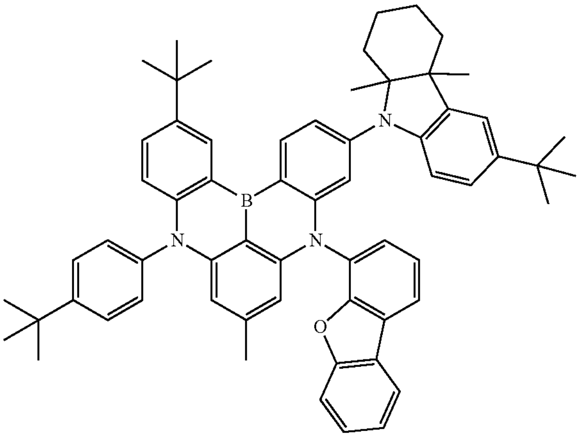
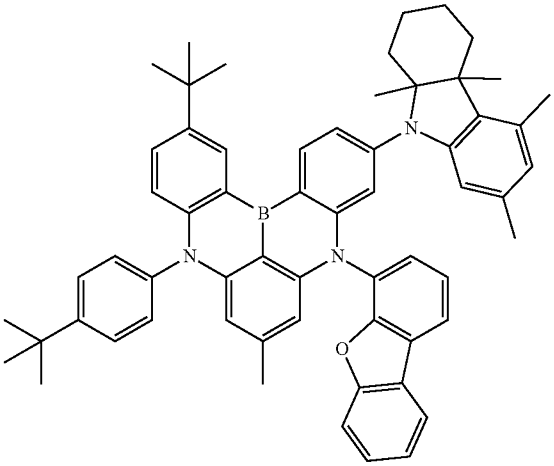
-continued
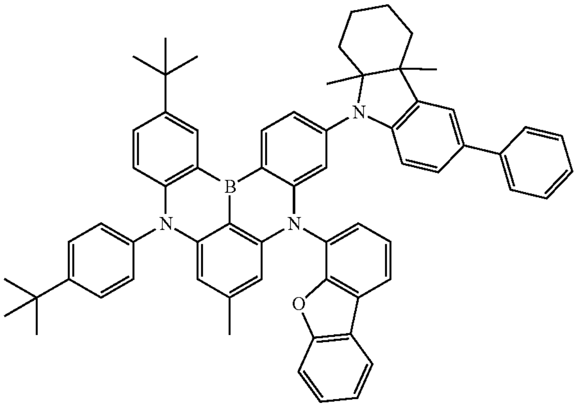
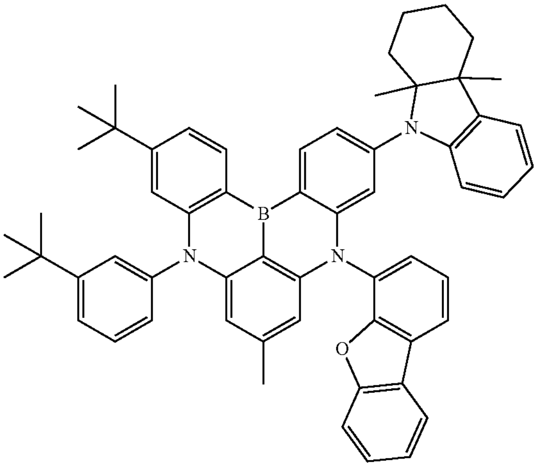
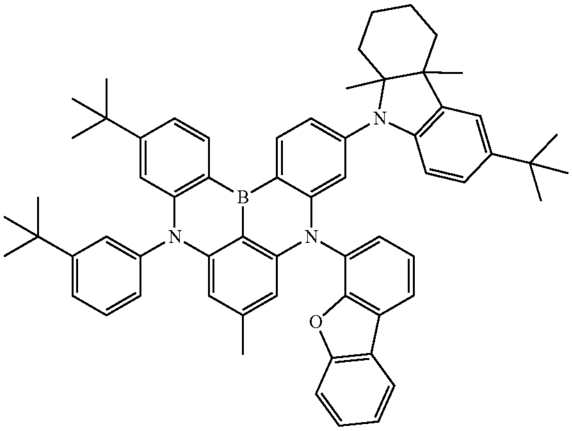

-continued
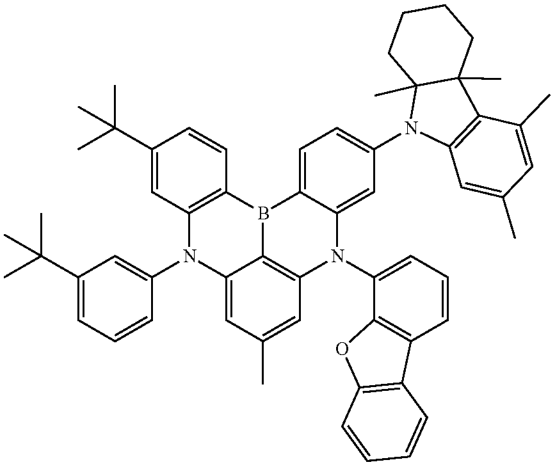
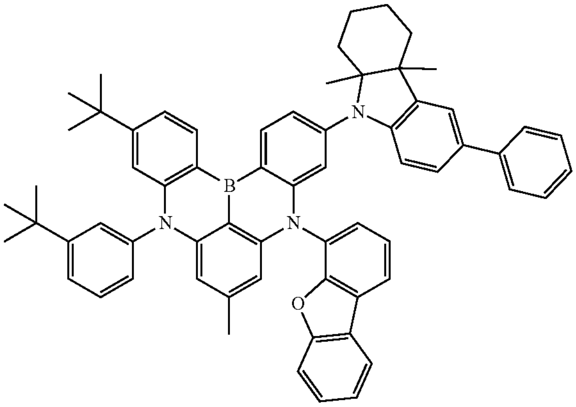
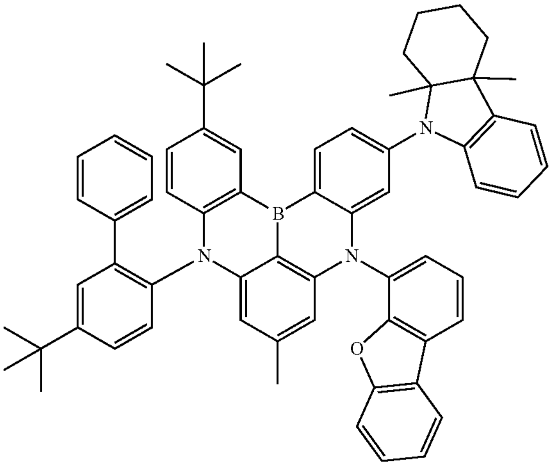
-continued
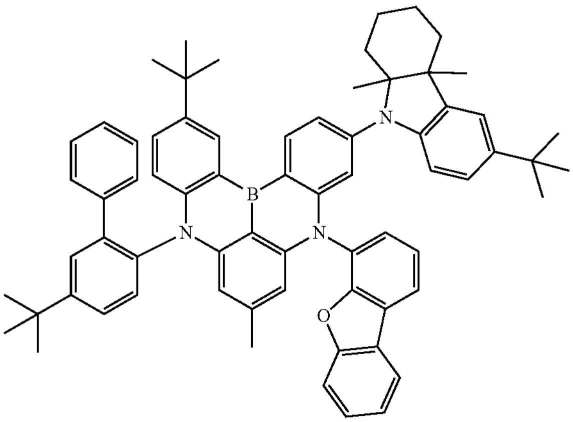
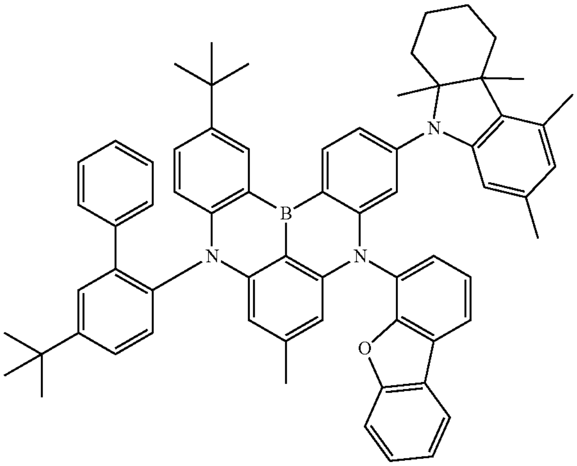
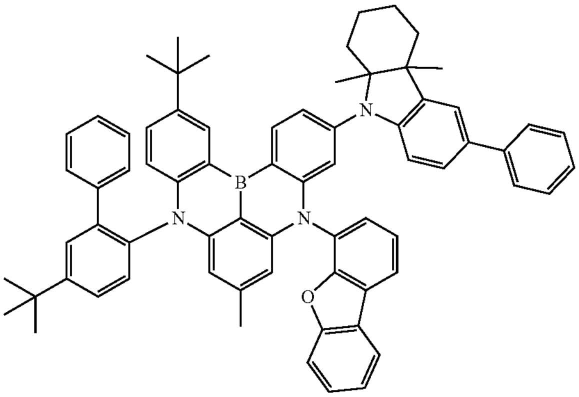

-continued
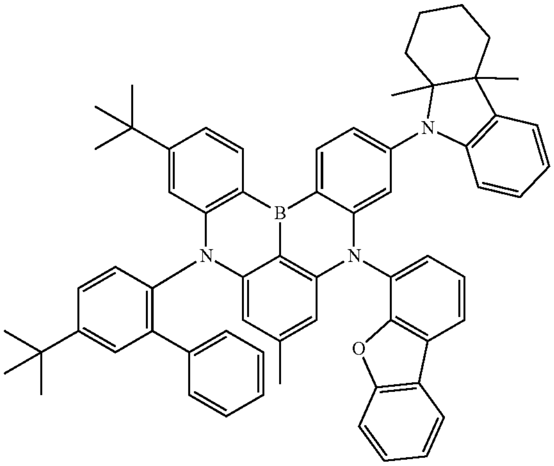
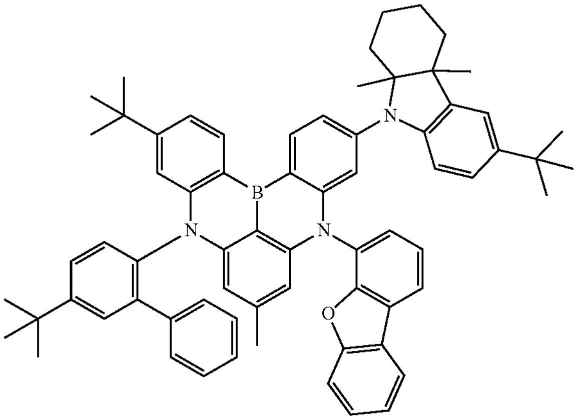
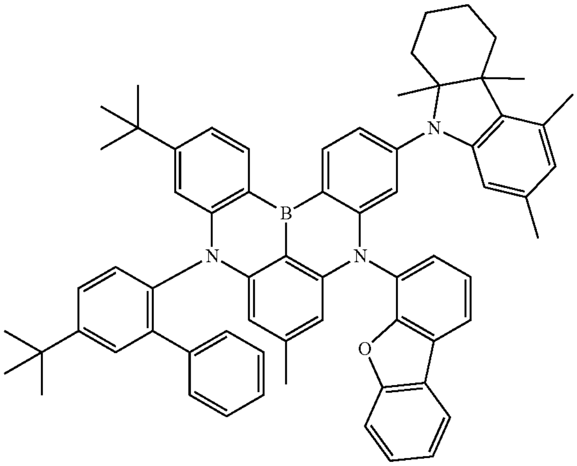
-continued
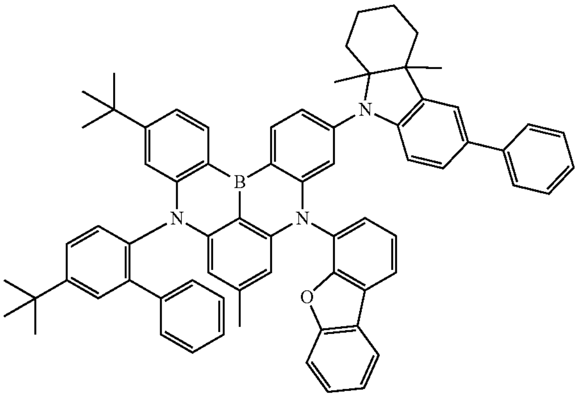
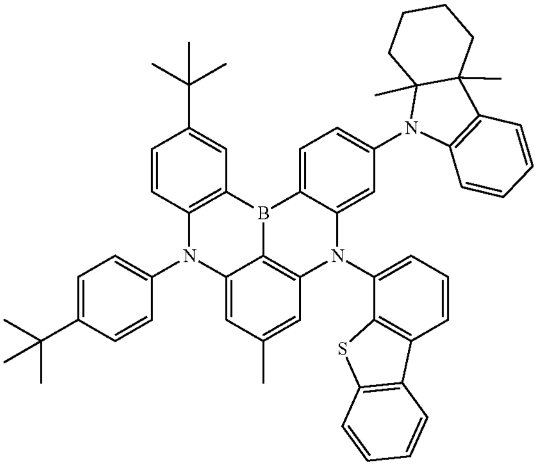
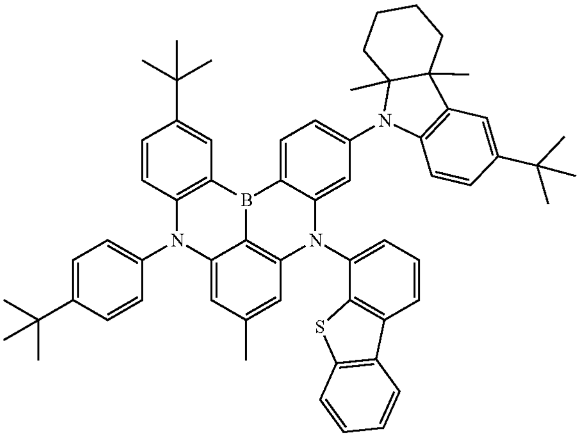

-continued
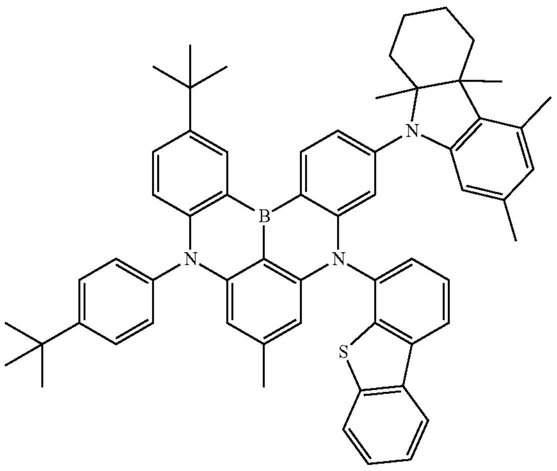
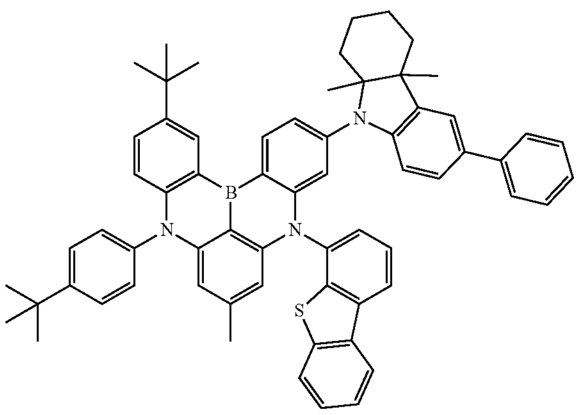
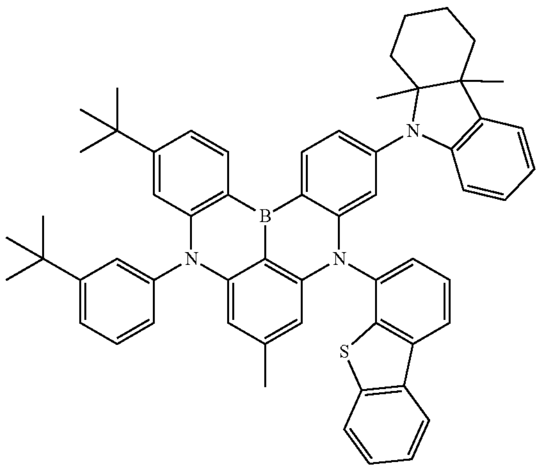
-continued
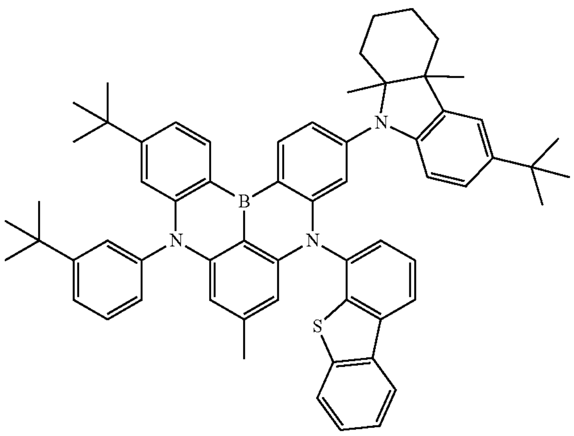
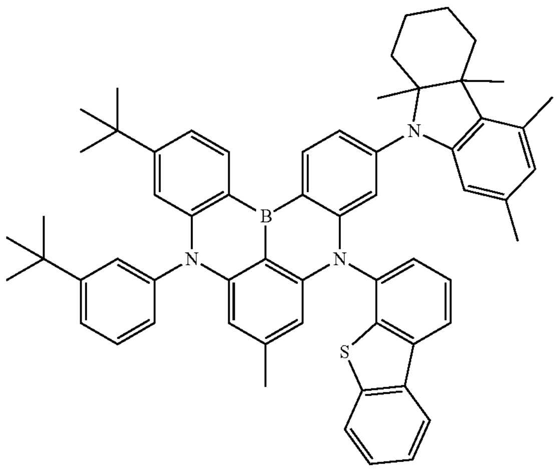
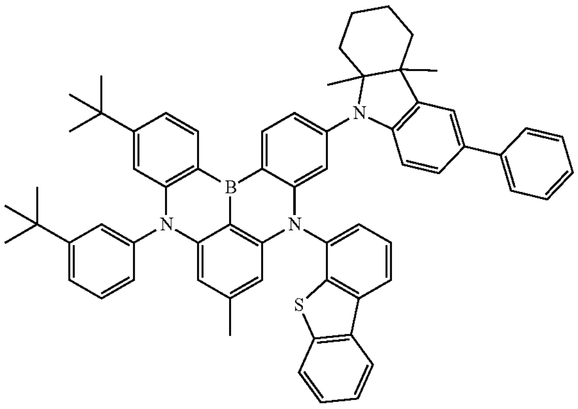

-continued
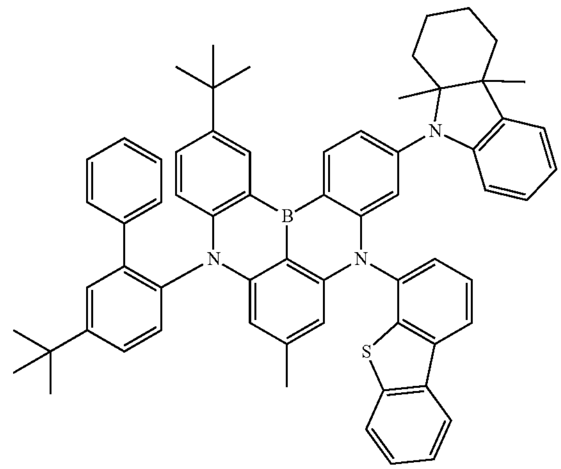
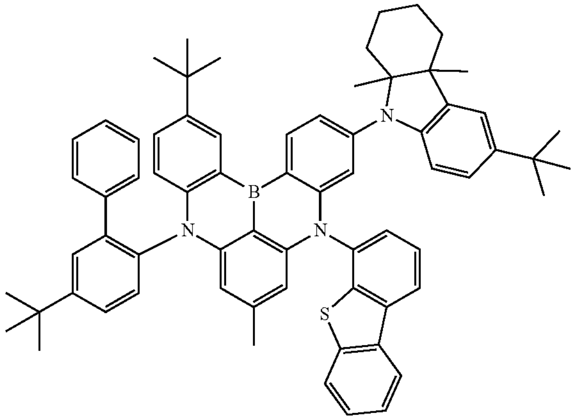
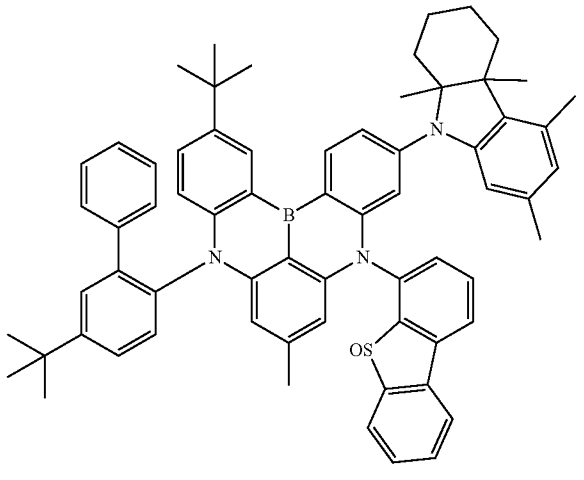
-continued
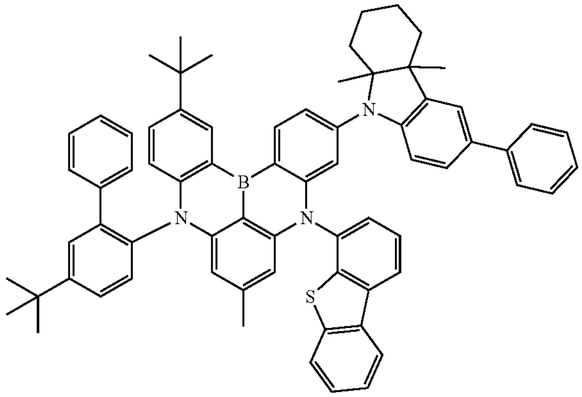
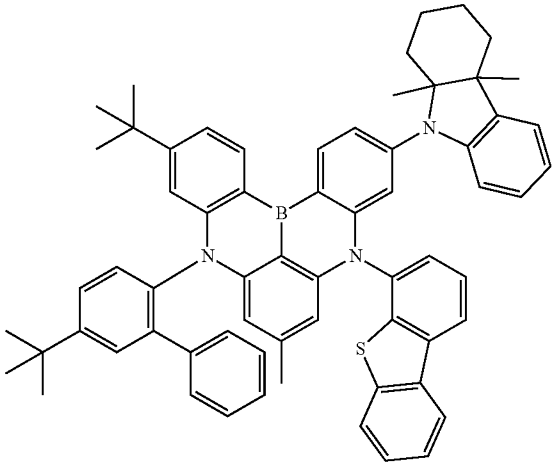
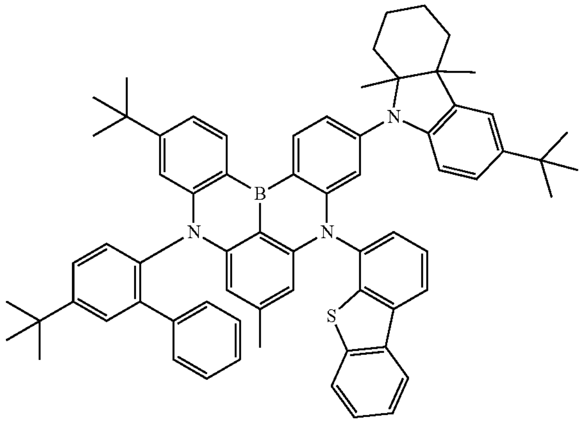

-continued
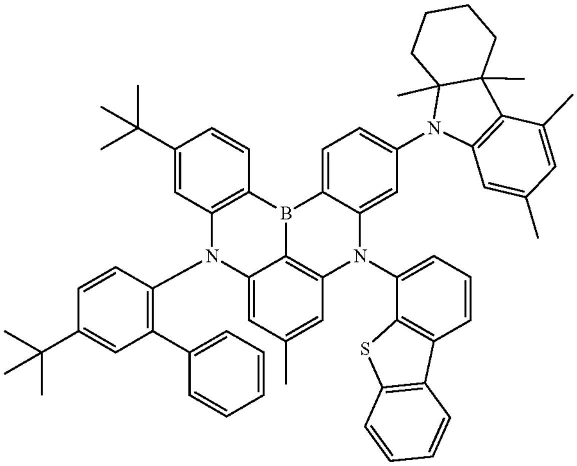
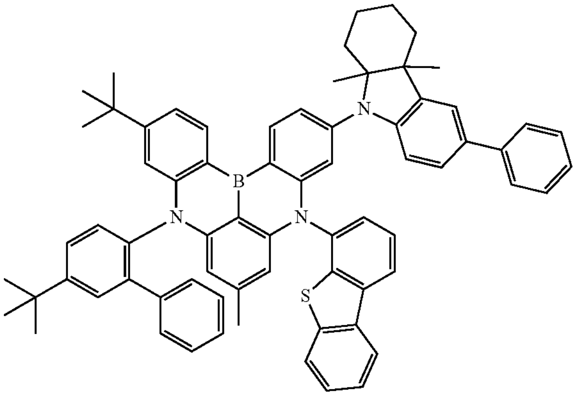
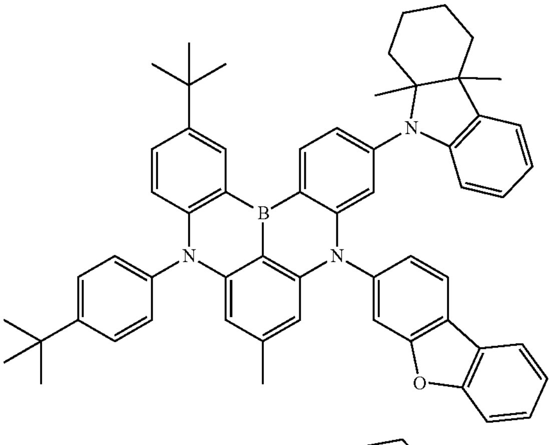
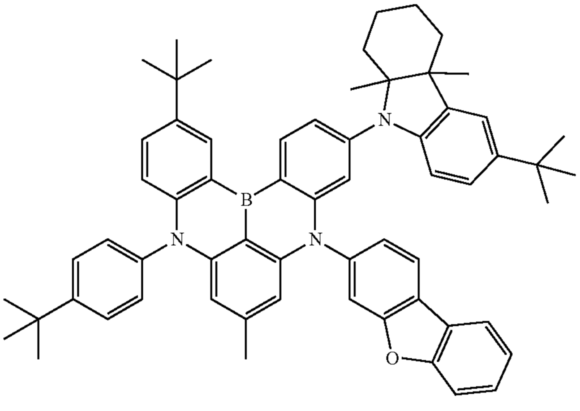
-continued
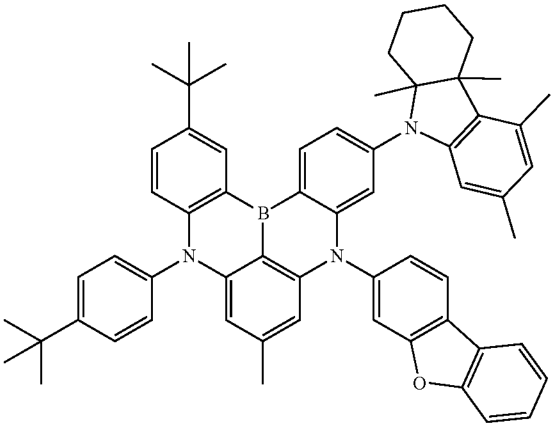
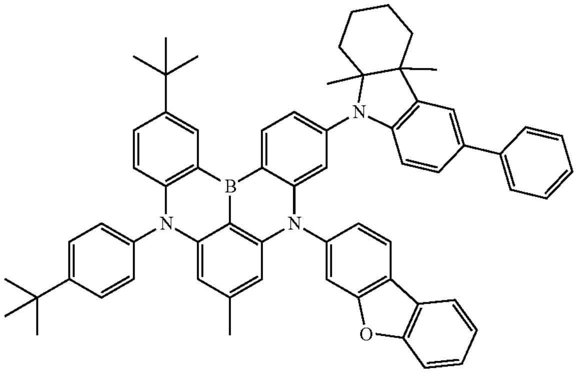
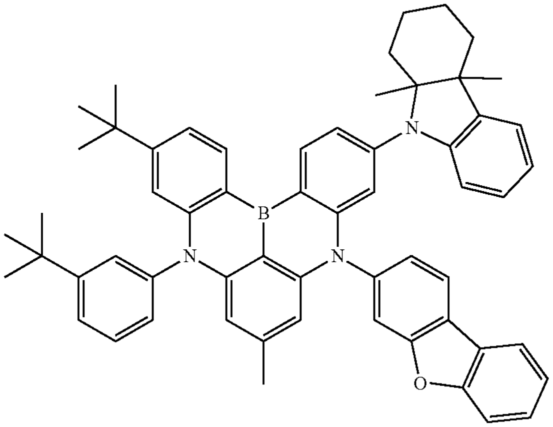
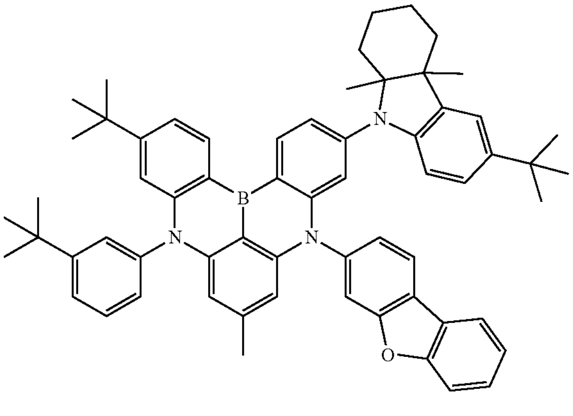

-continued
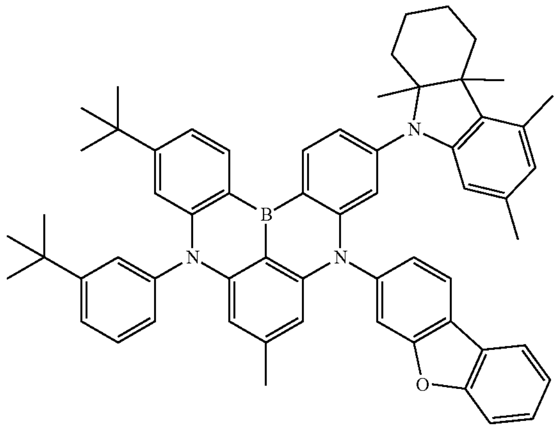
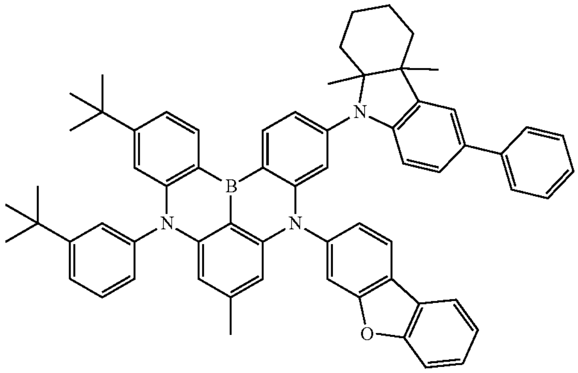
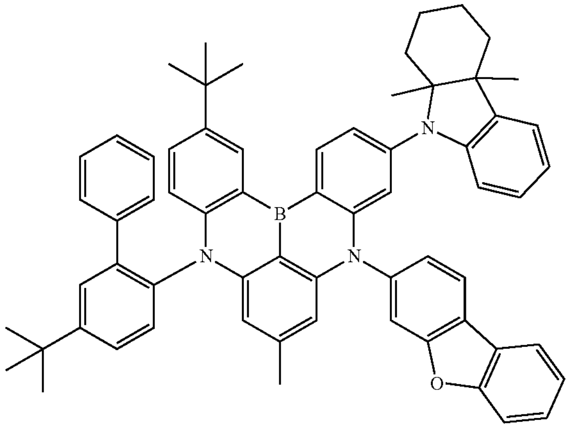
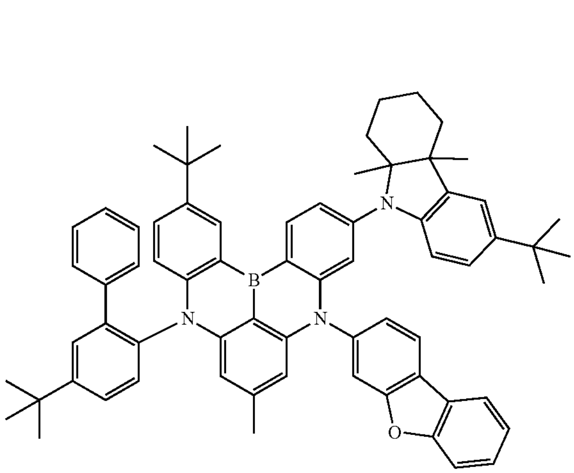
-continued
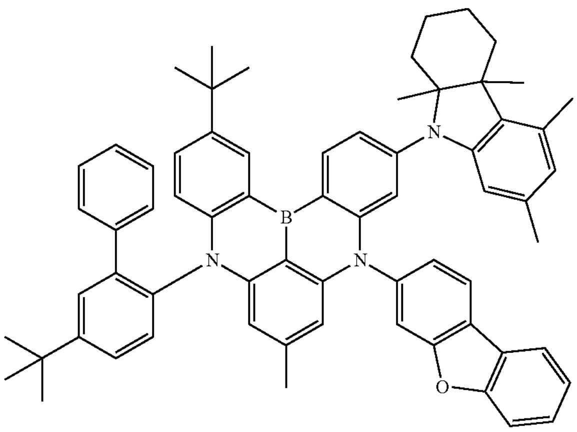
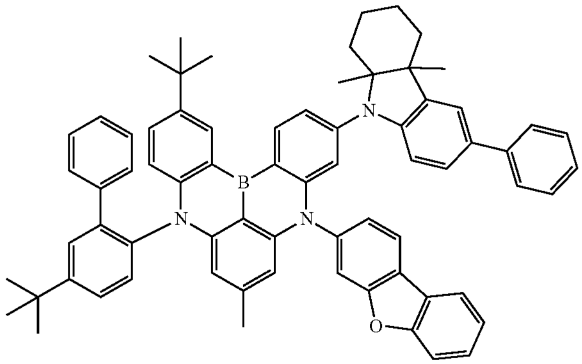
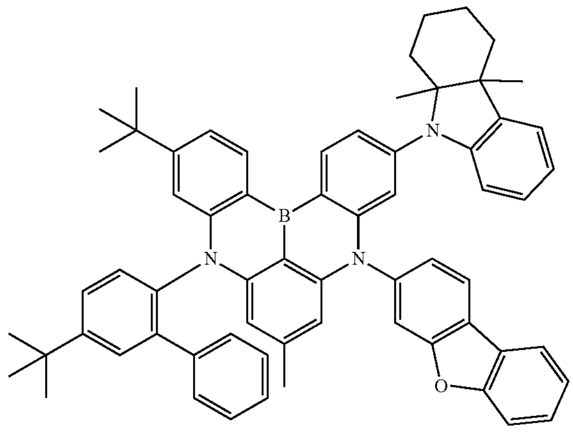
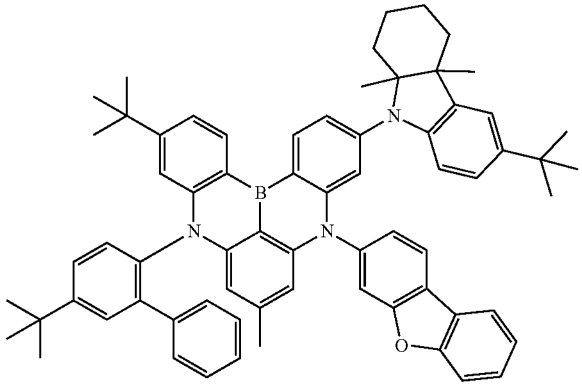

-continued
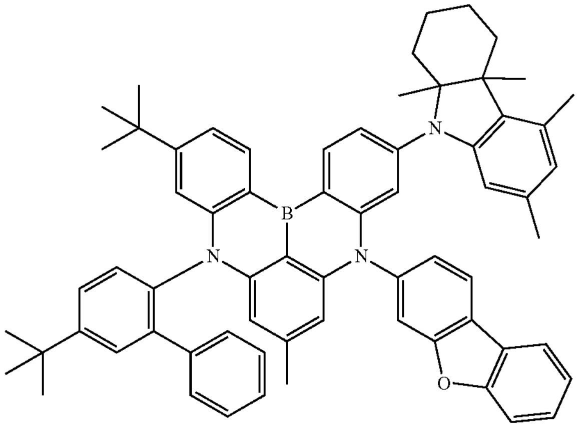
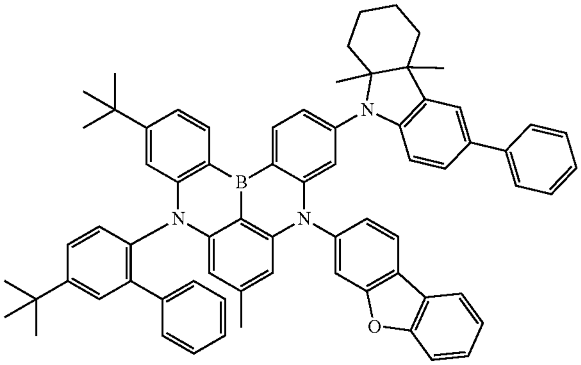
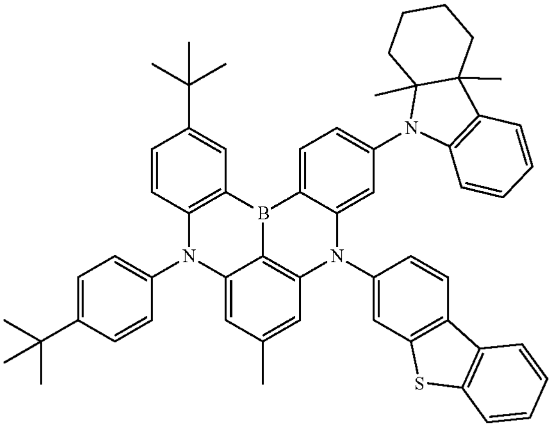
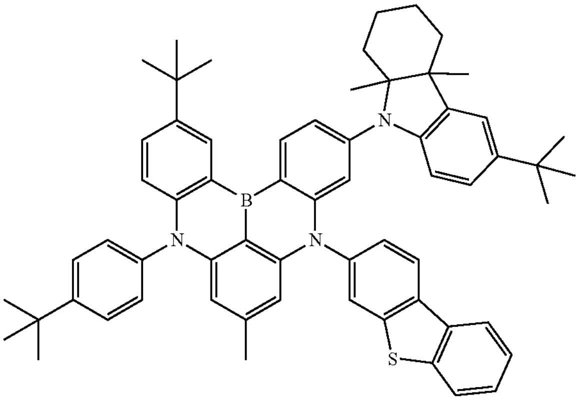
-continued
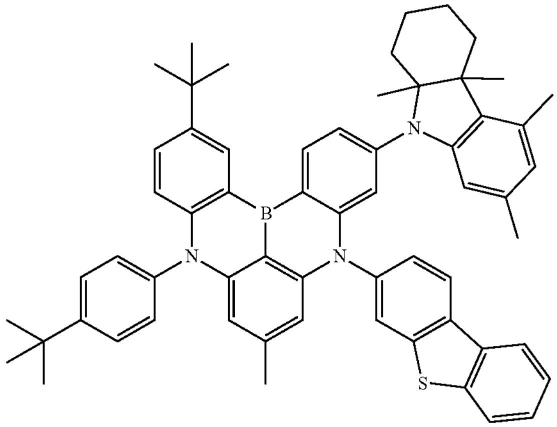
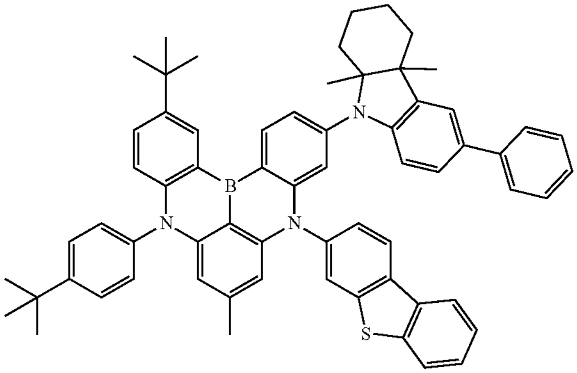
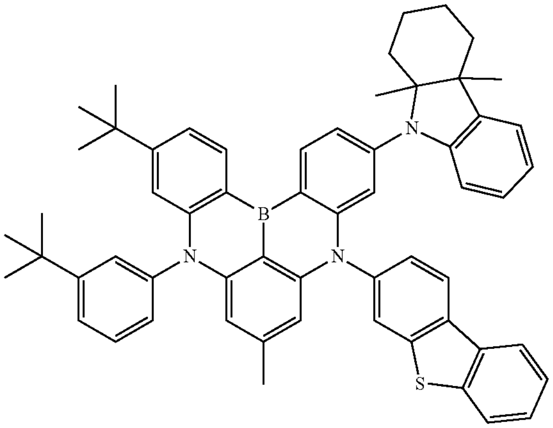
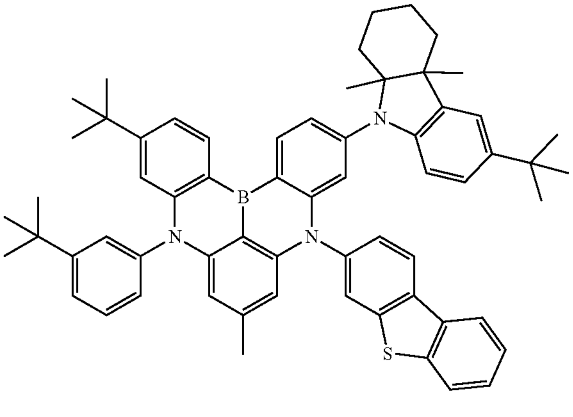

-continued
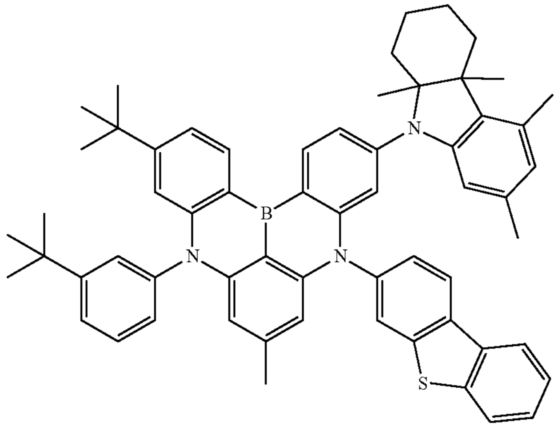
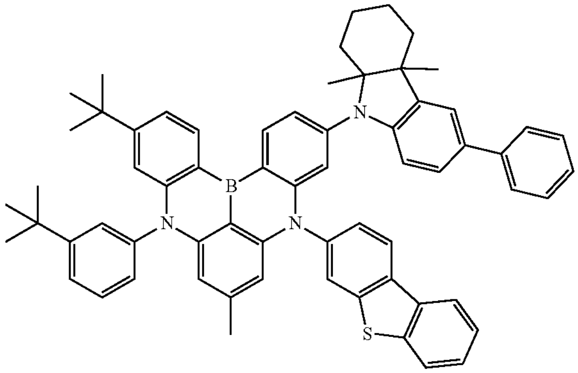
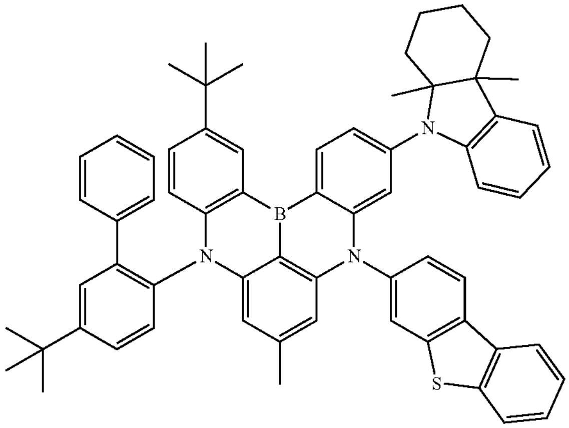
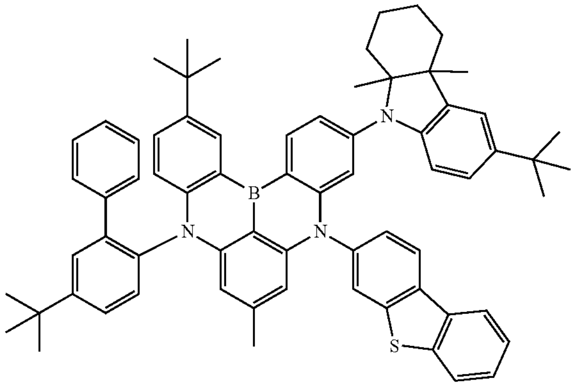
-continued
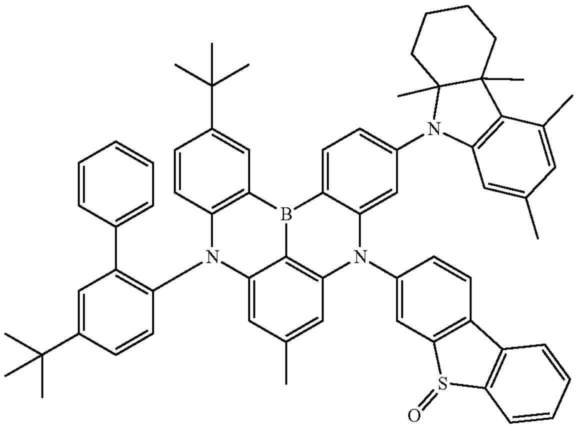
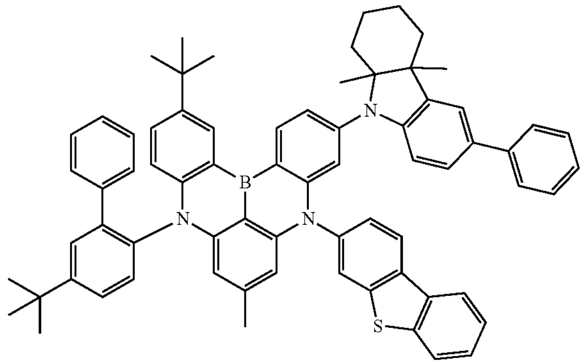
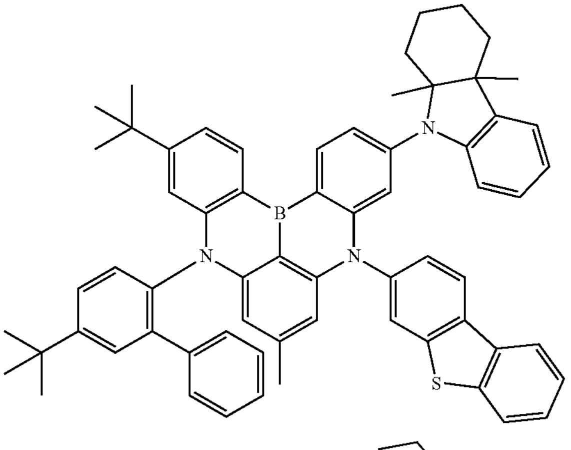
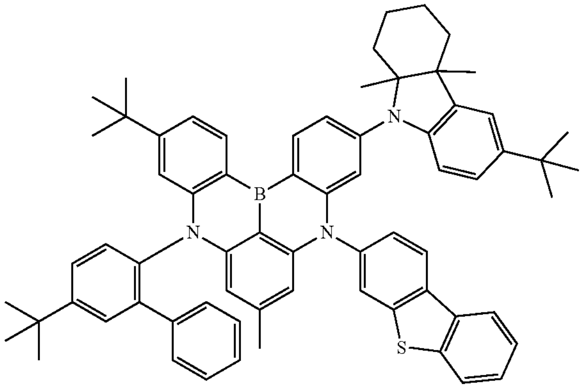

-continued
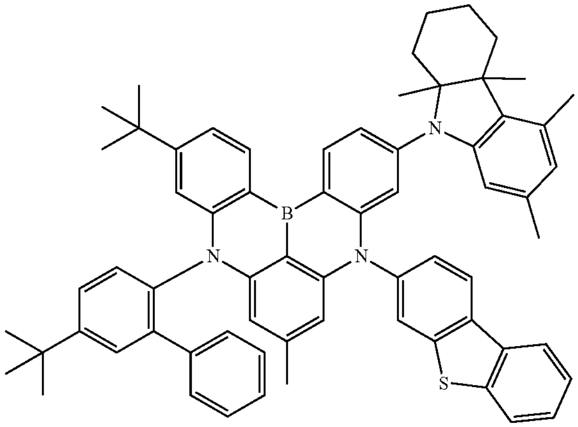
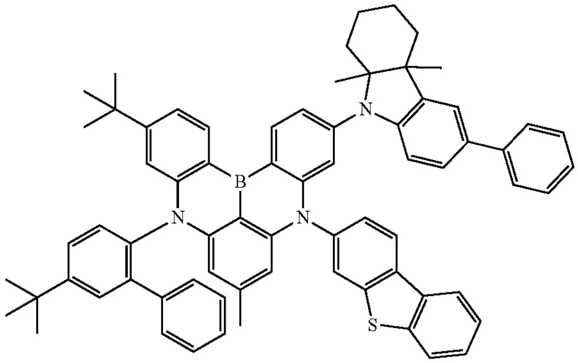
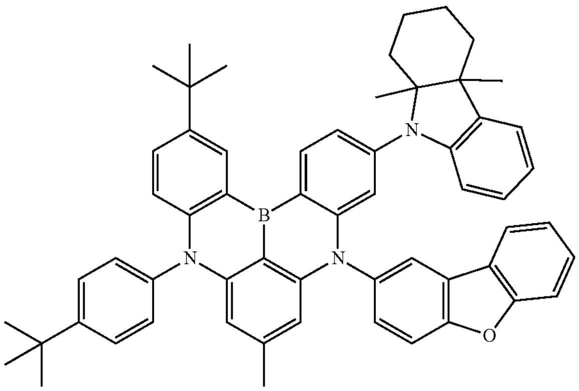
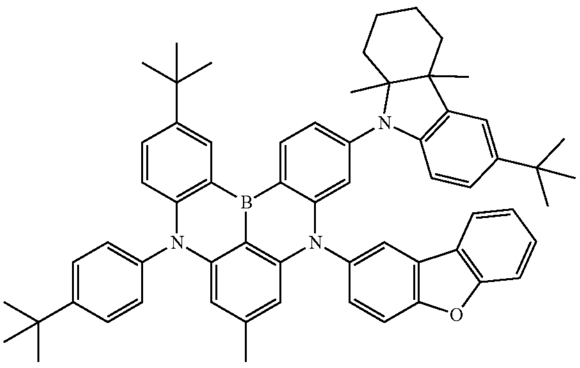
-continued
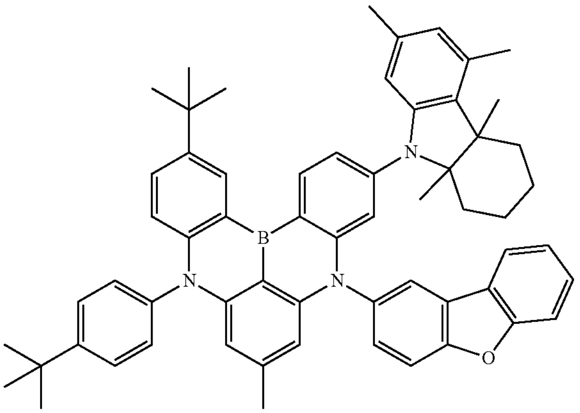
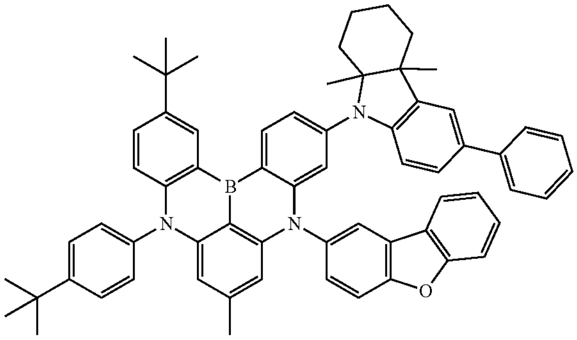
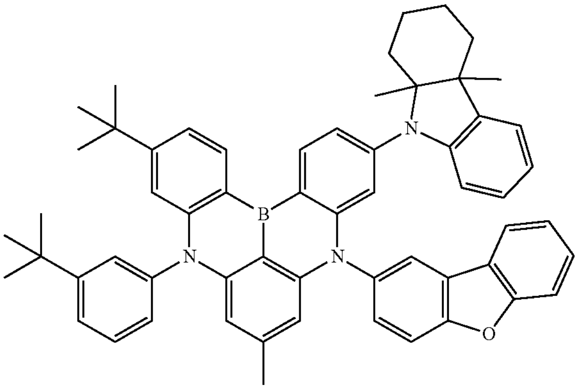
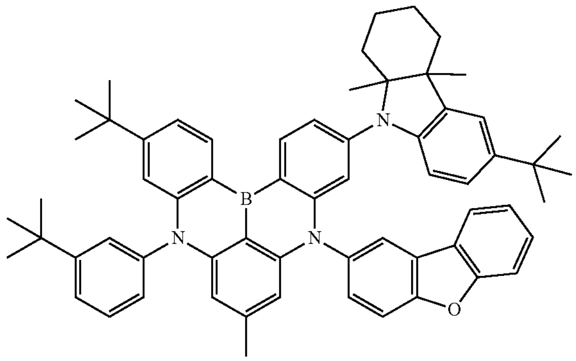

-continued
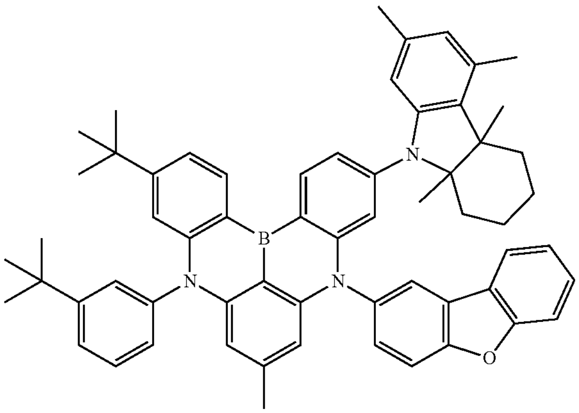
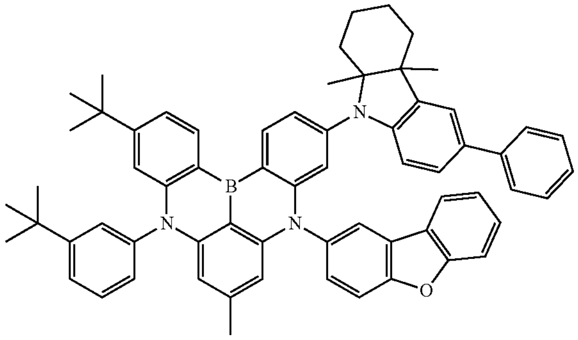
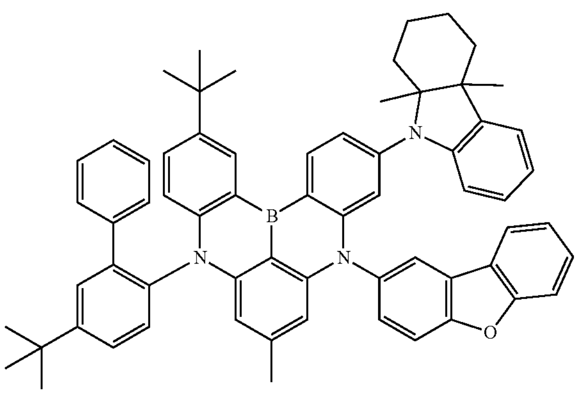
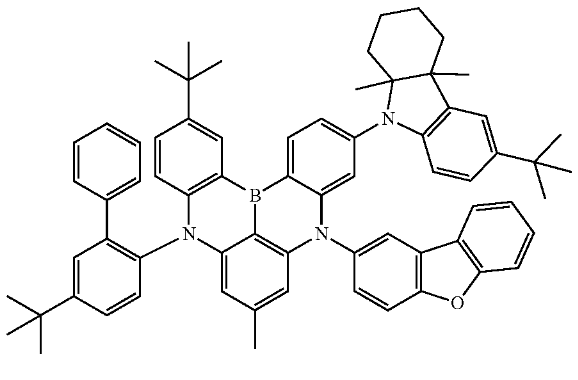
-continued
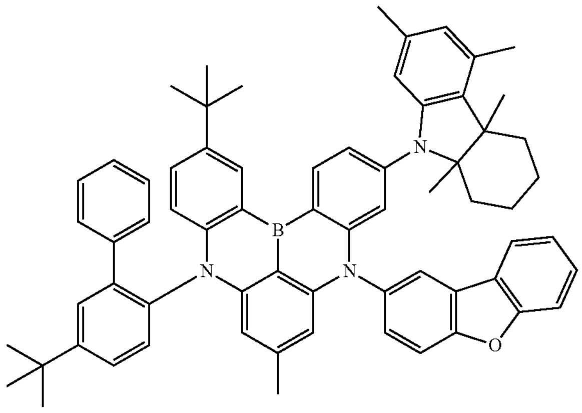
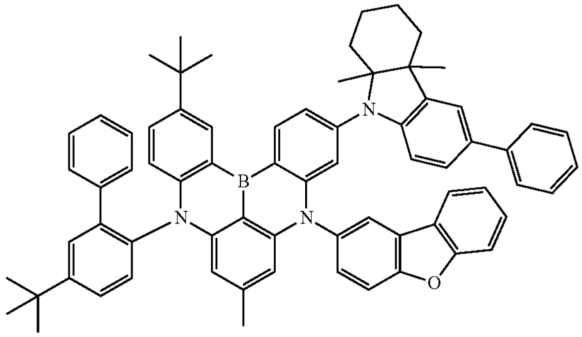
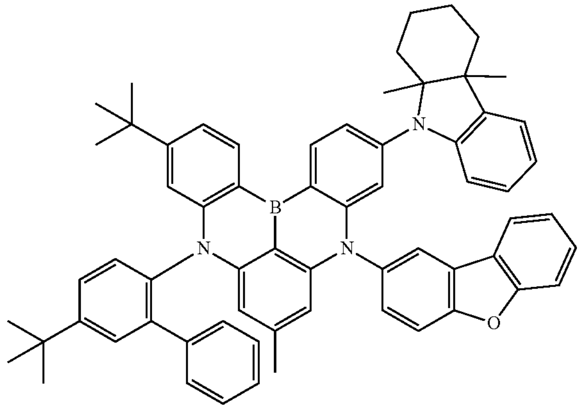
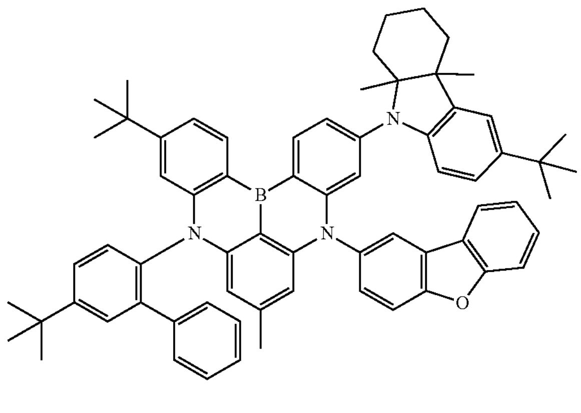

-continued
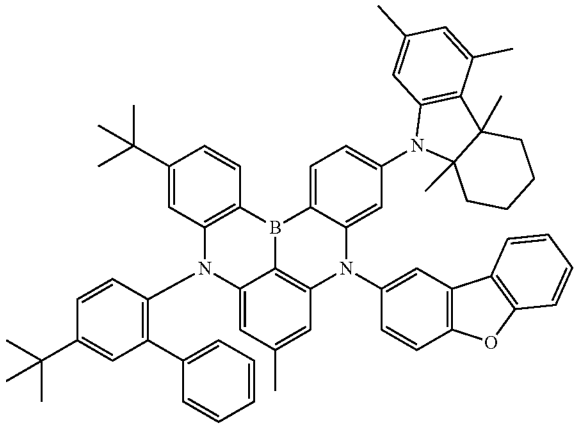
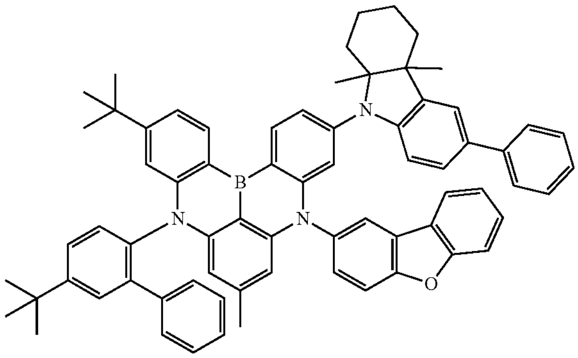
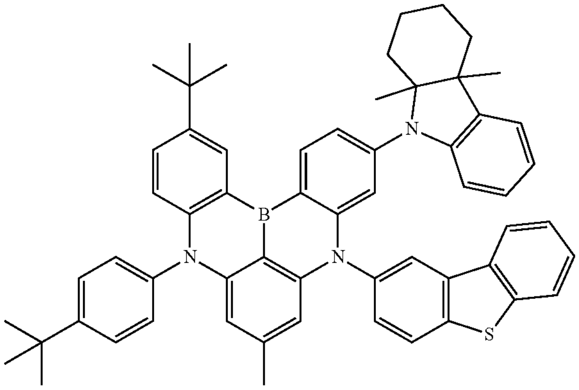
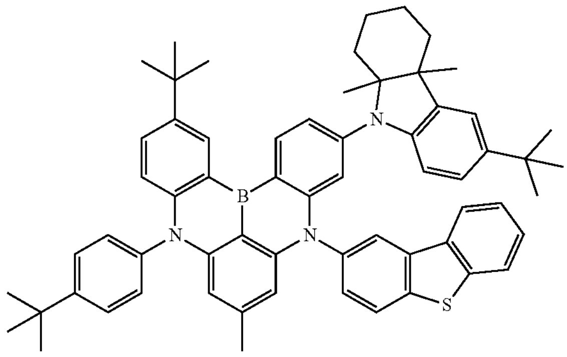
-continued
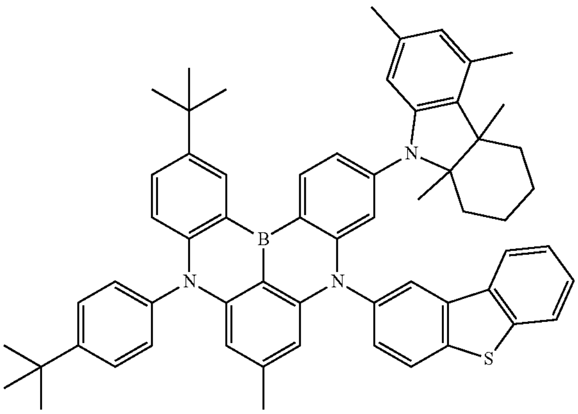
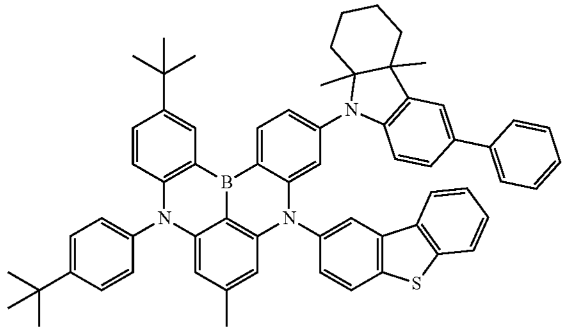
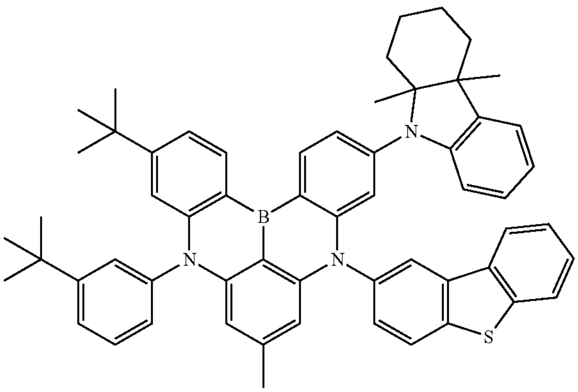
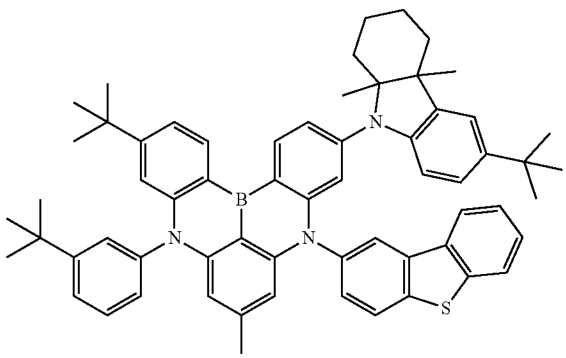

-continued
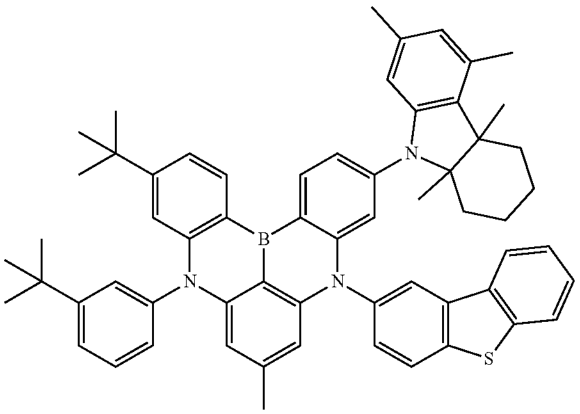
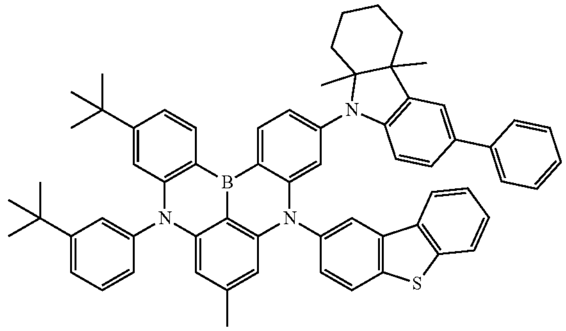
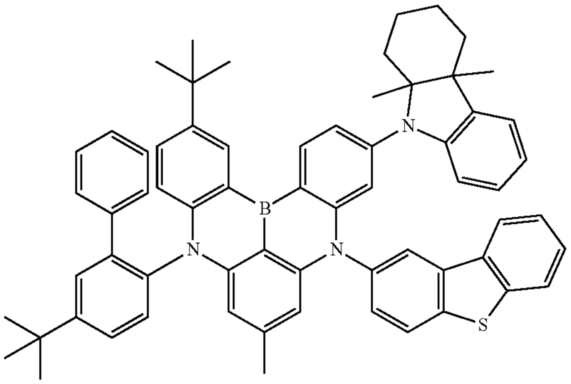
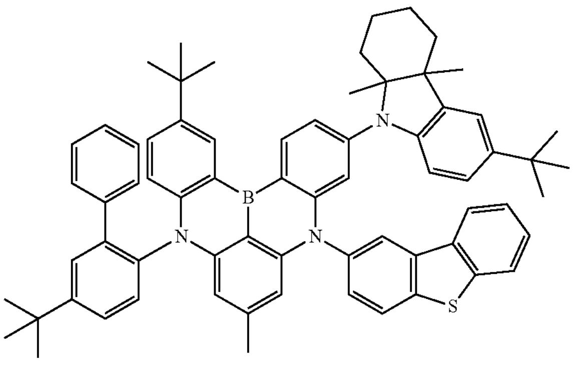
-continued
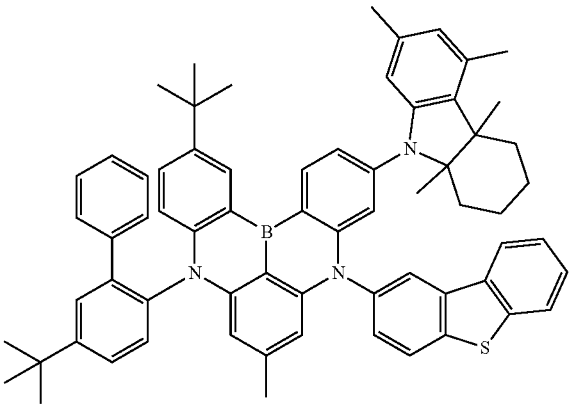
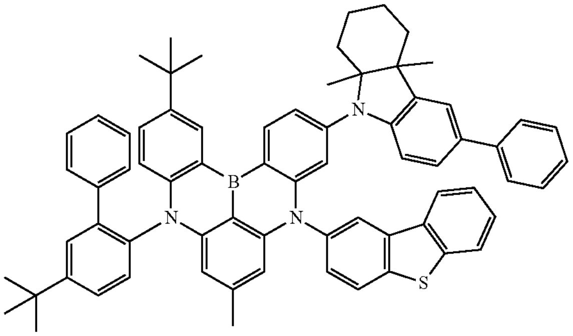
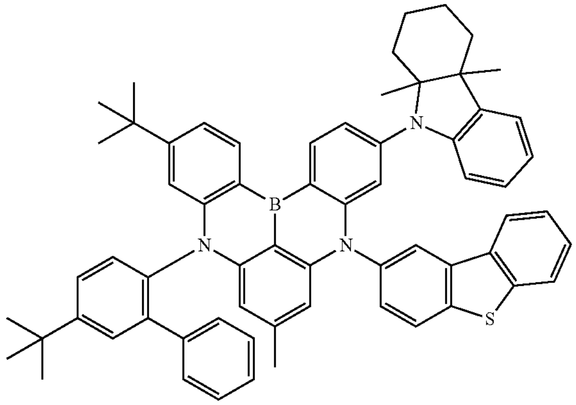
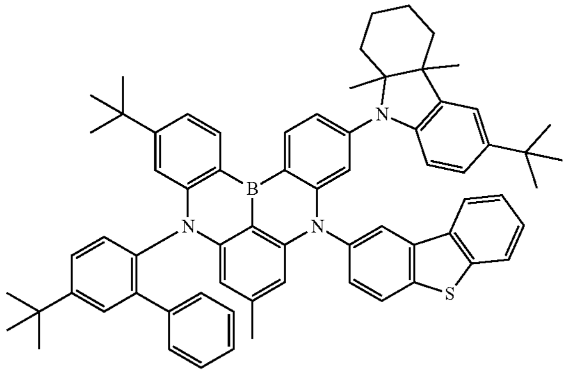

-continued
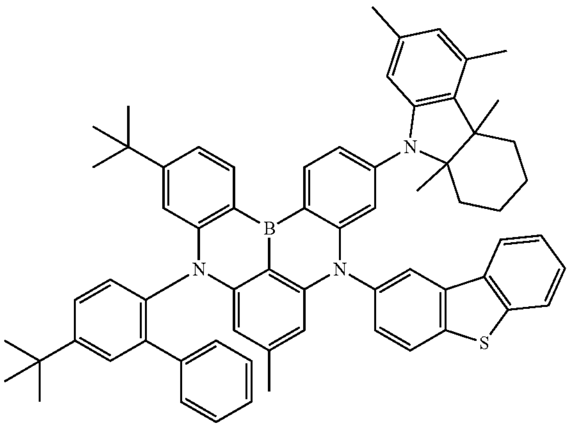
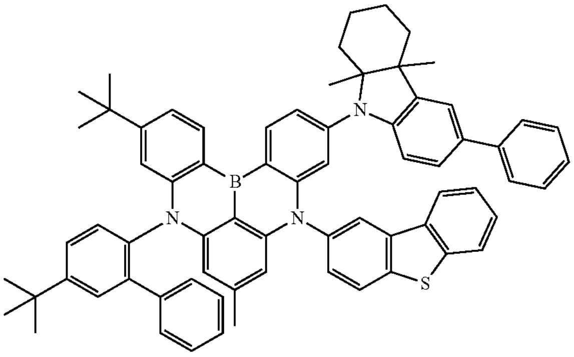
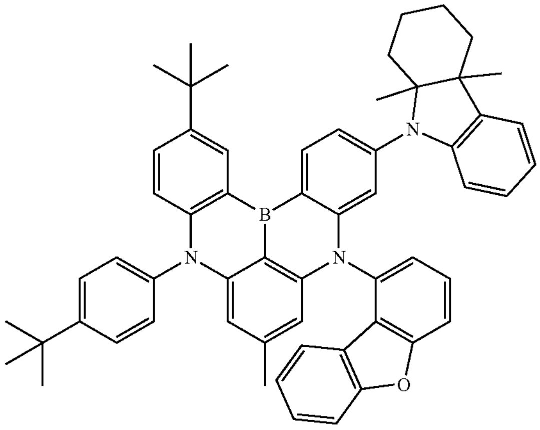
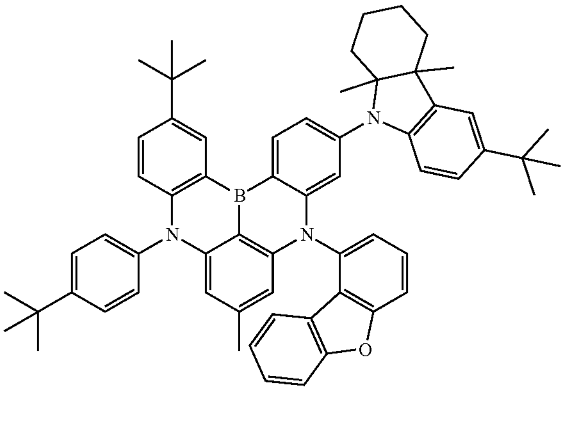
-continued
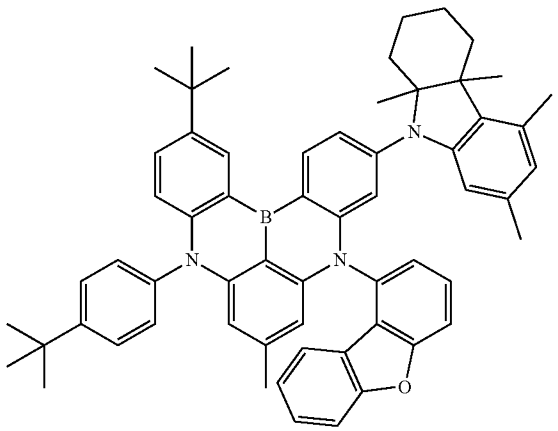
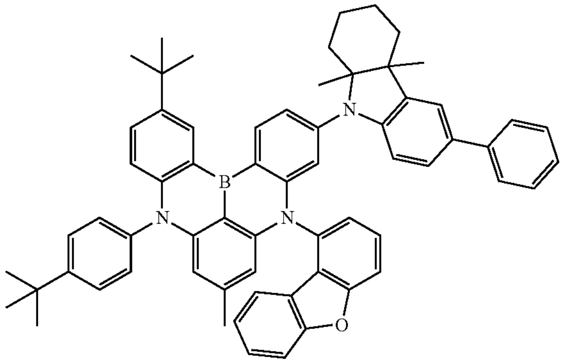
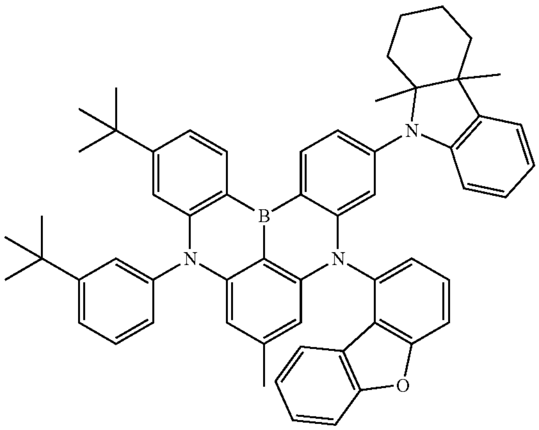
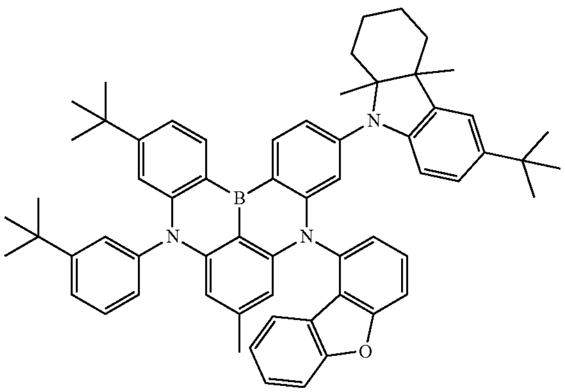

-continued
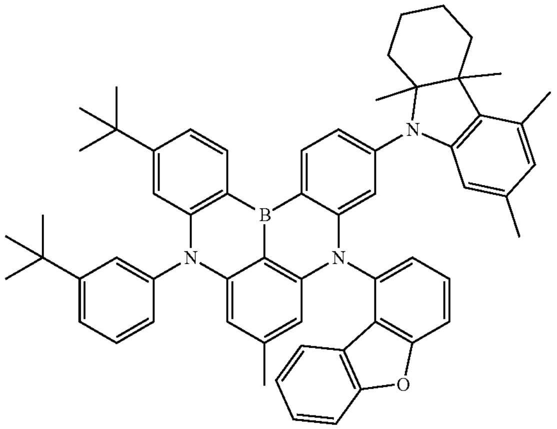
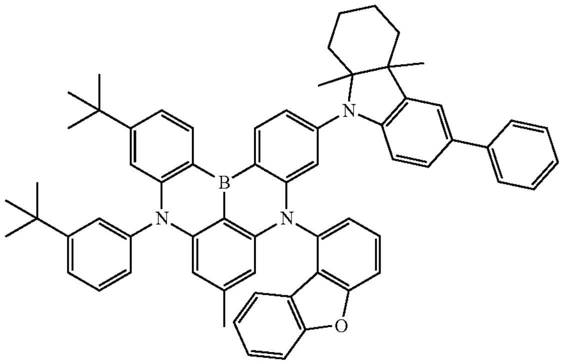
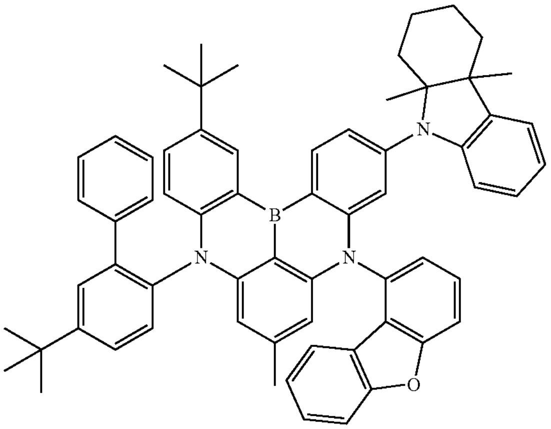
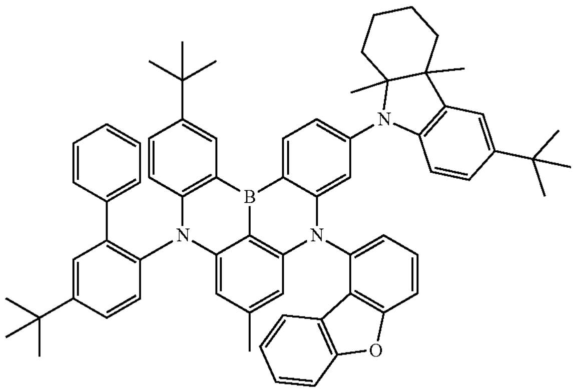
-continued
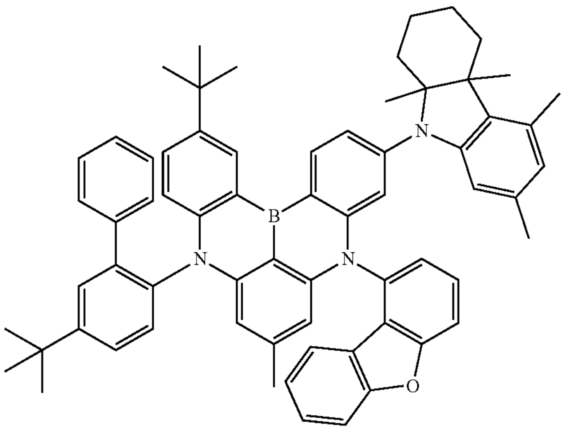
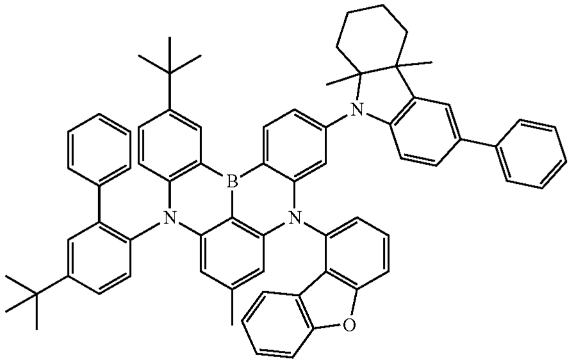
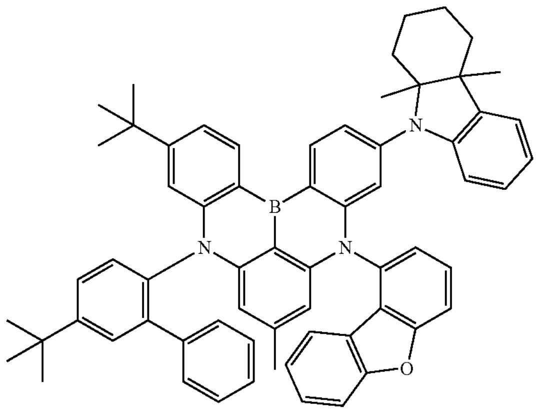
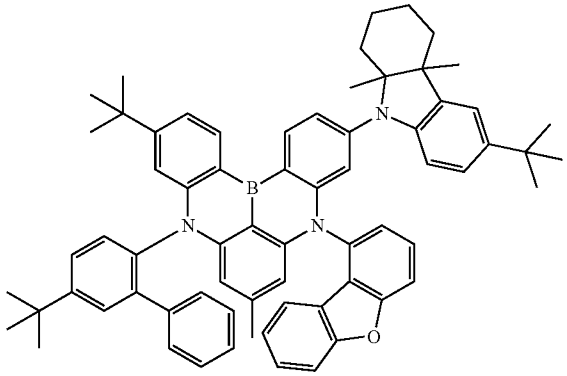

-continued
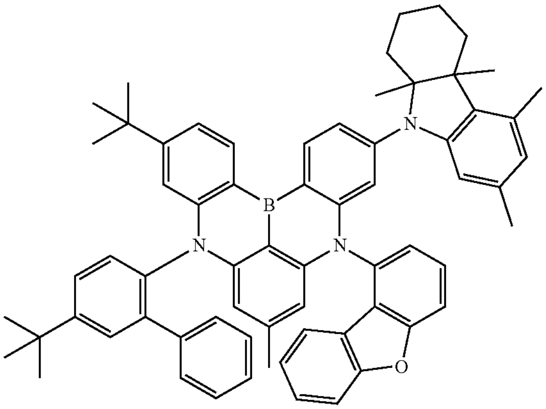
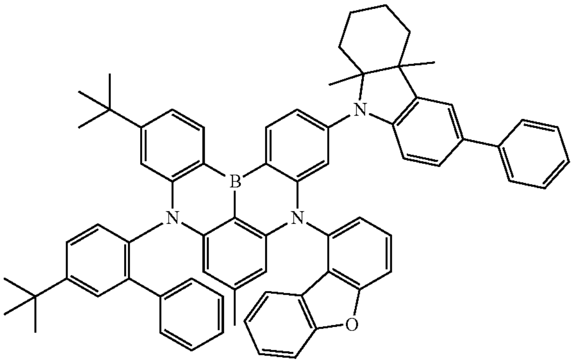
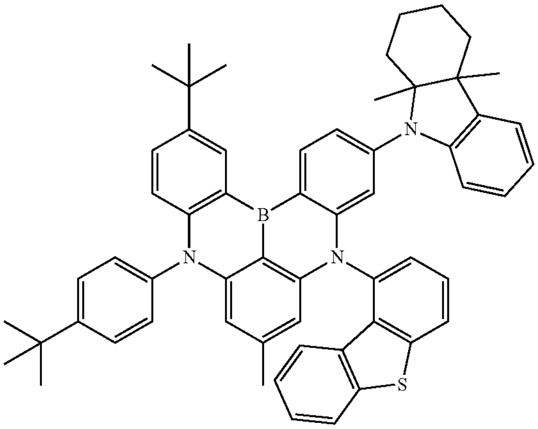
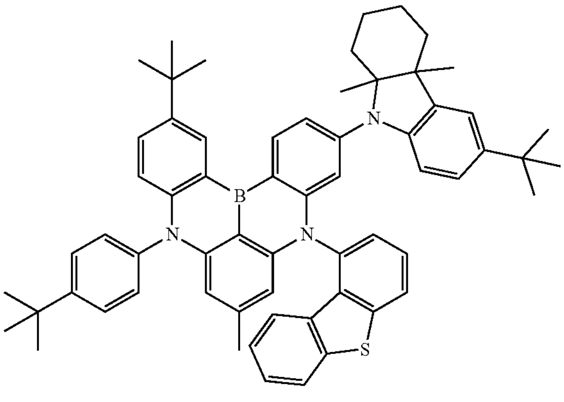
-continued
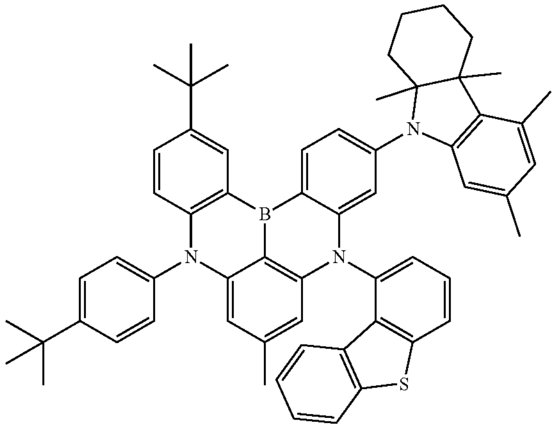
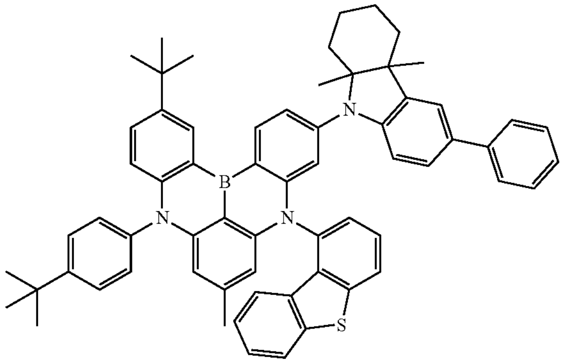
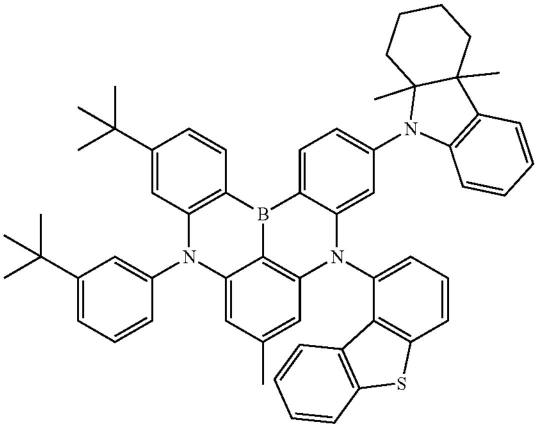
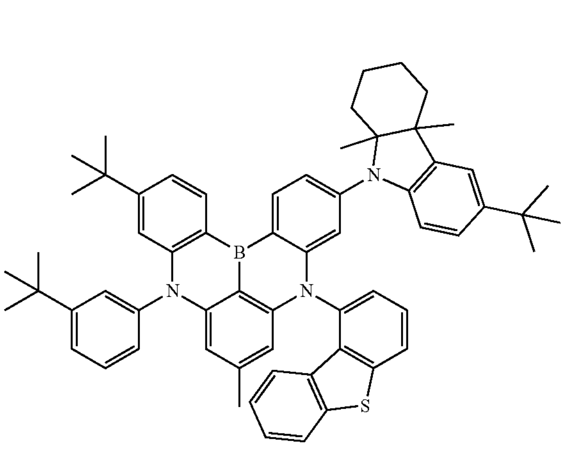

-continued
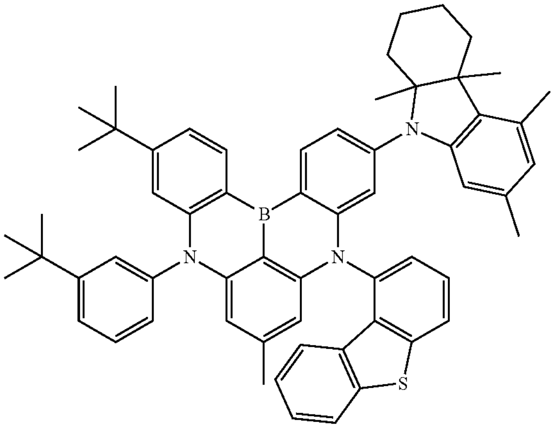
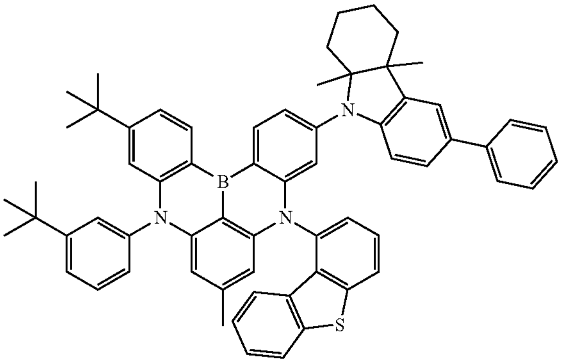
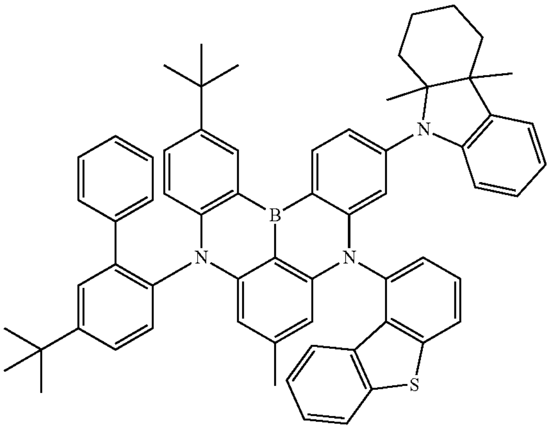
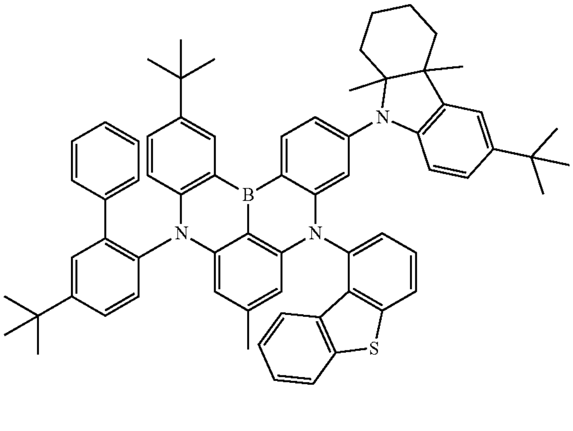
-continued
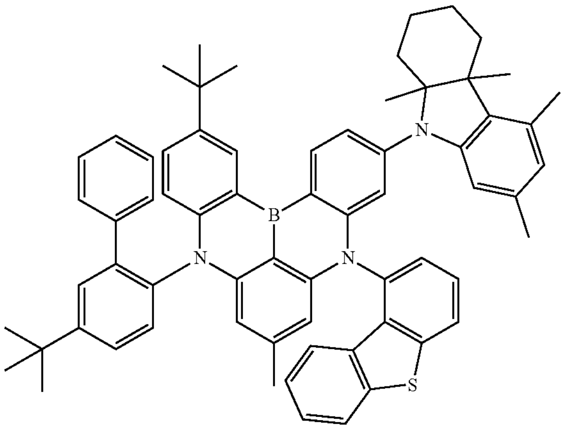
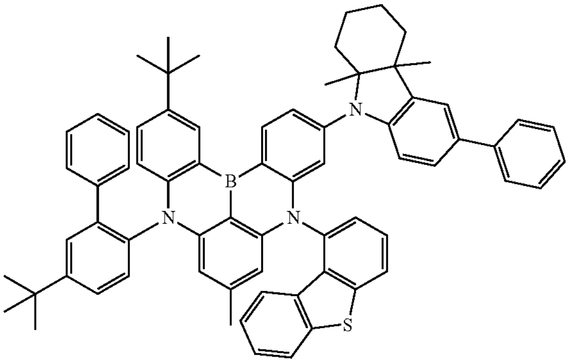
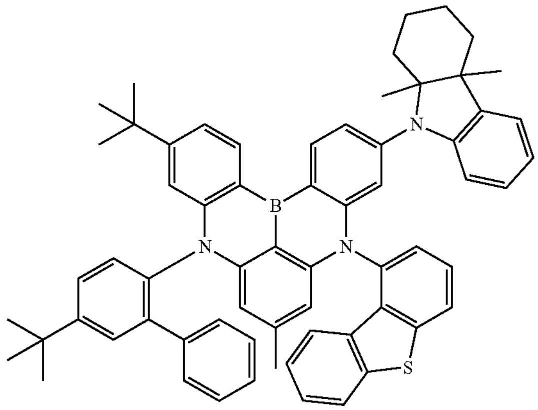
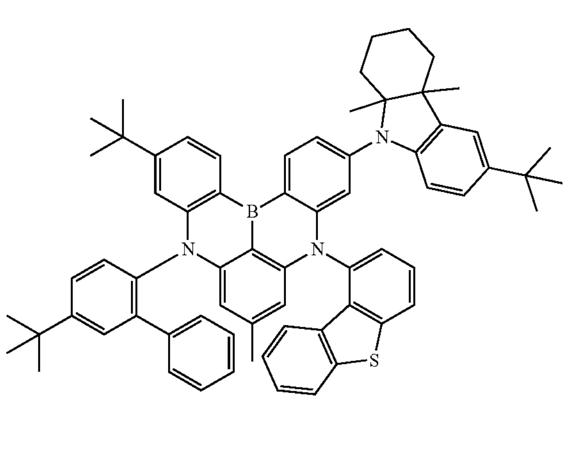

-continued
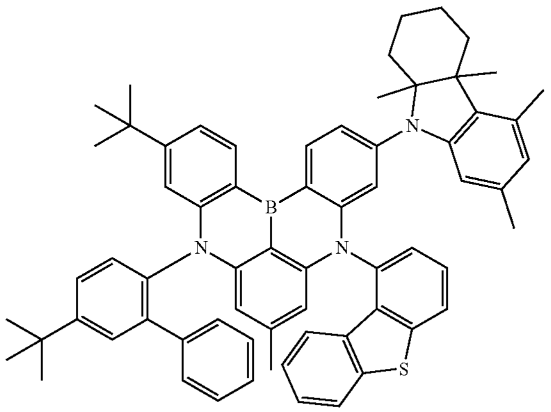
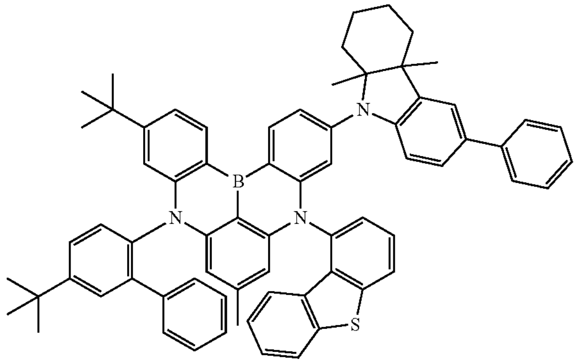
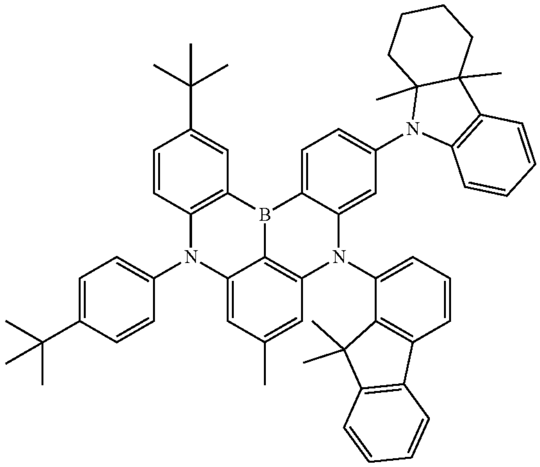
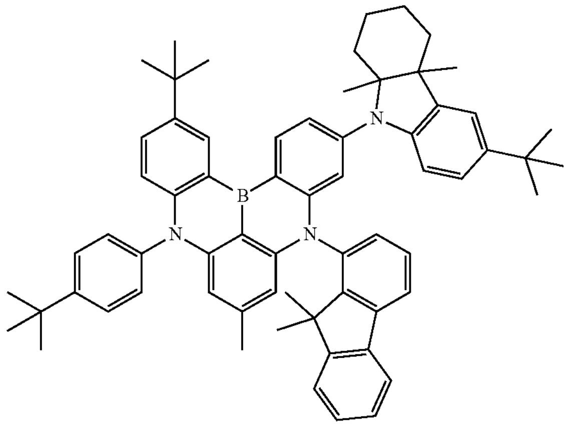
-continued
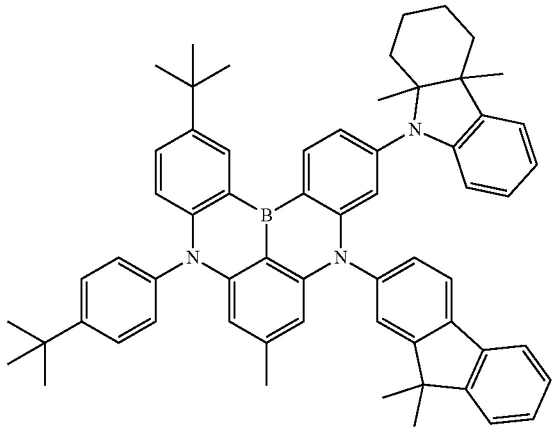
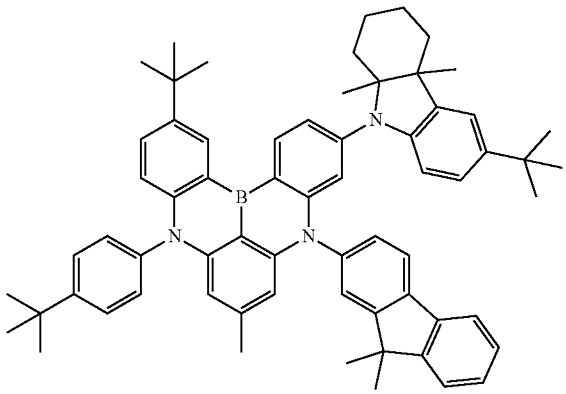
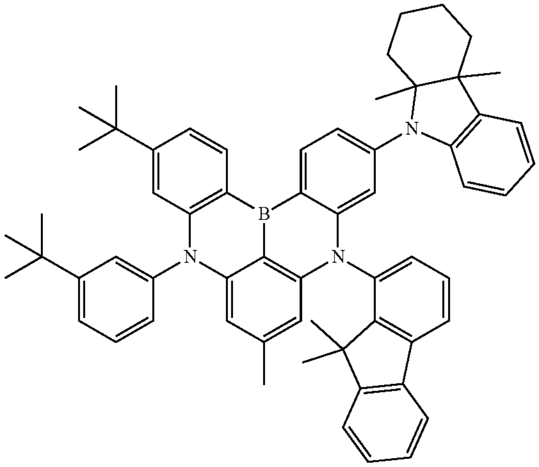
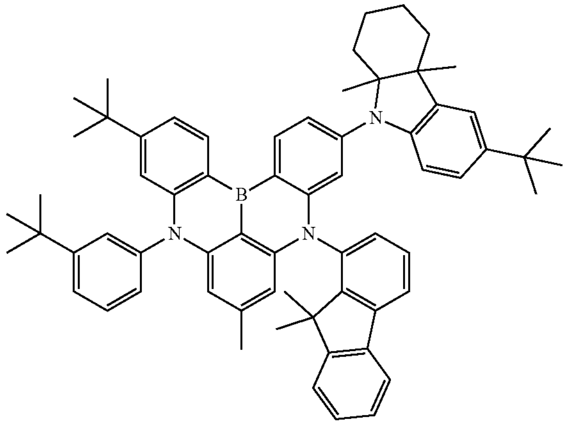

-continued
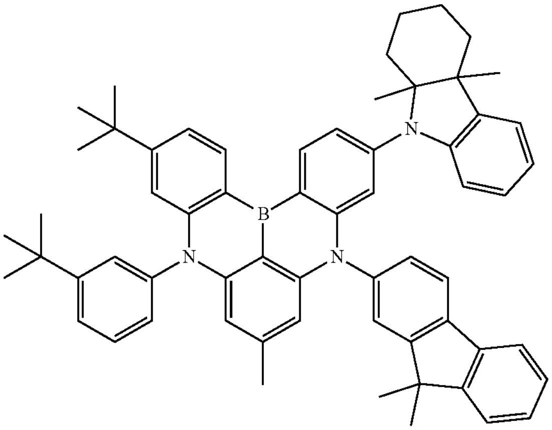
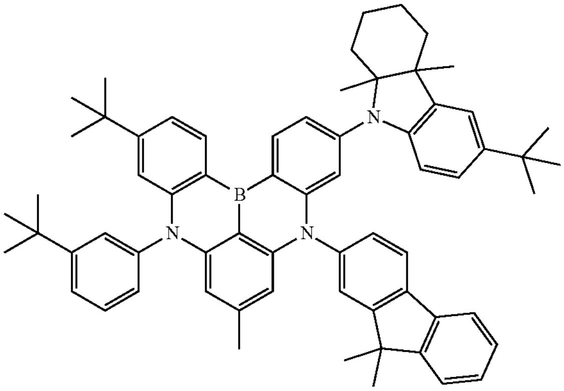
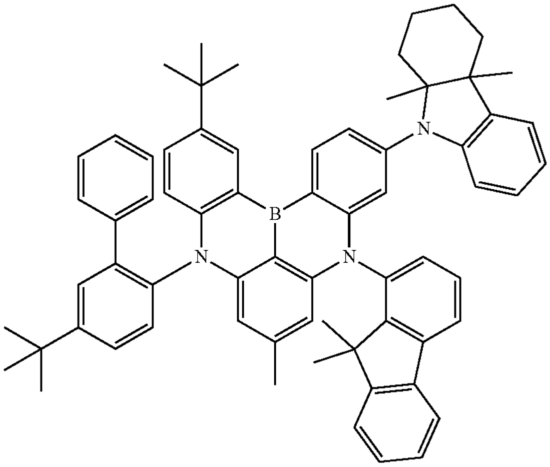
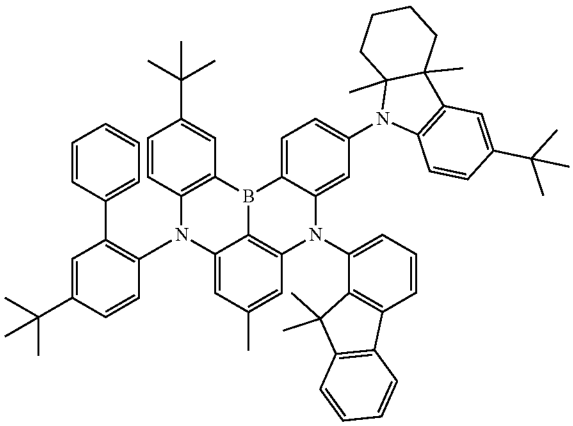
-continued
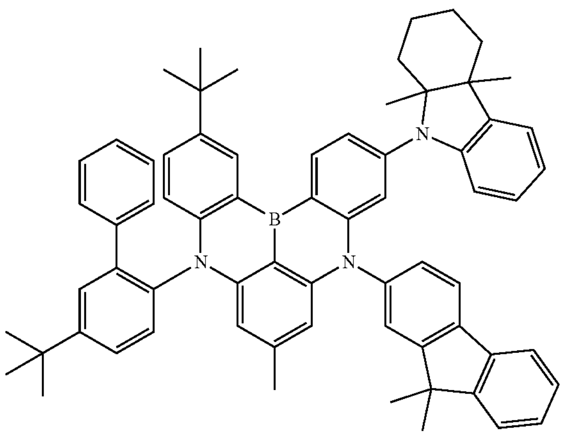
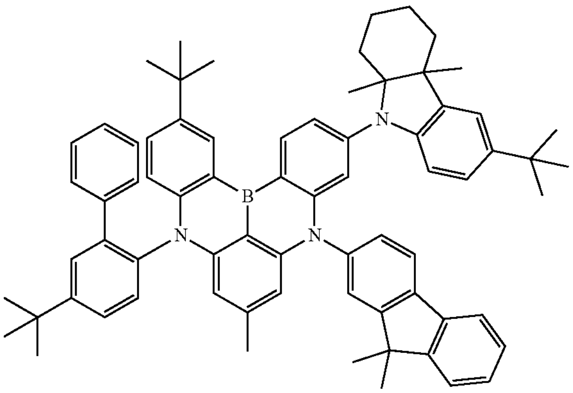
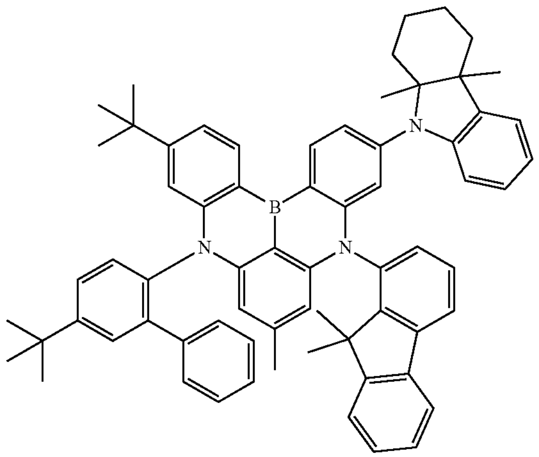
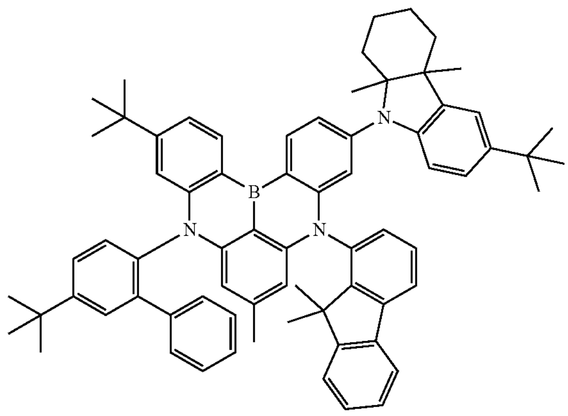

-continued
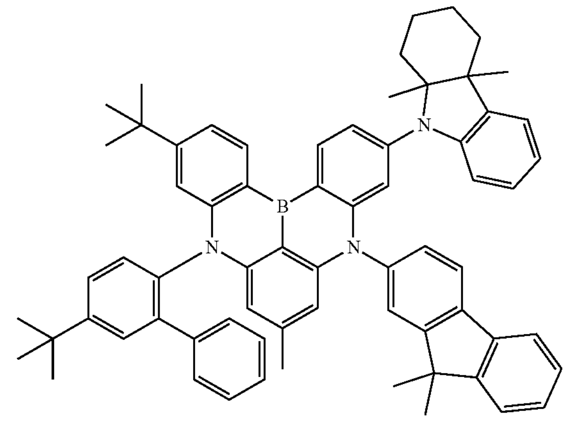
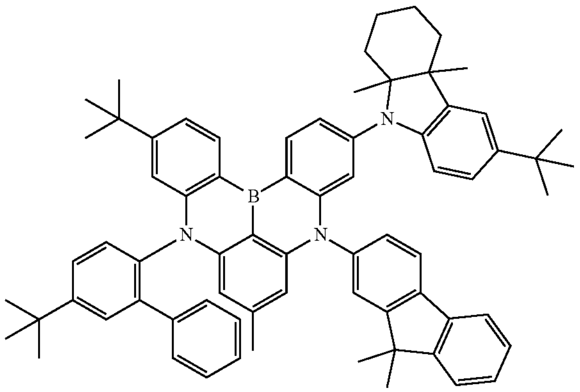
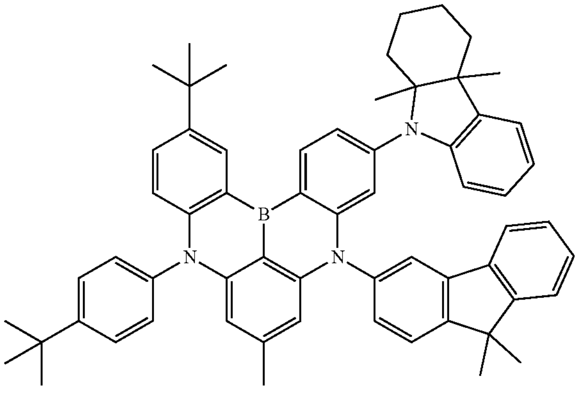
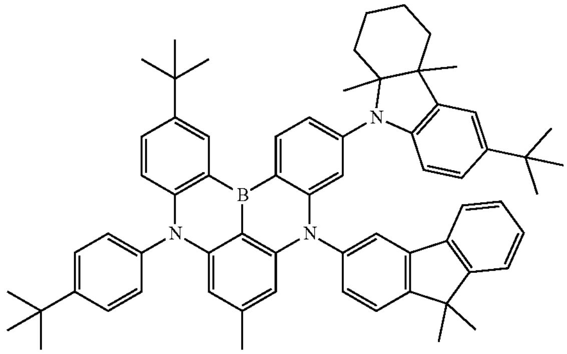
-continued
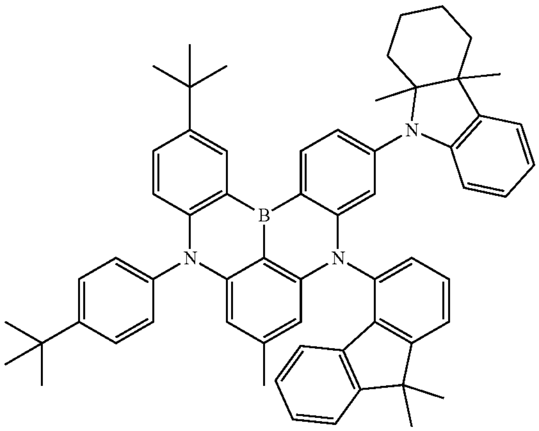
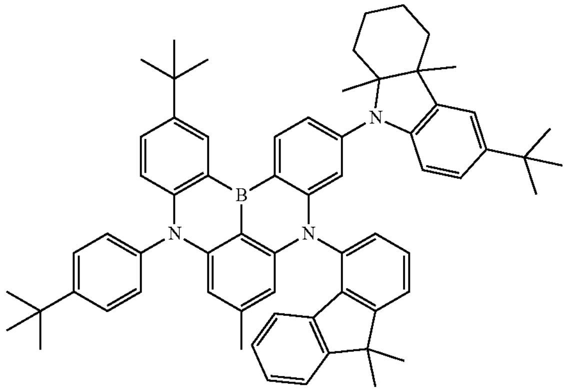
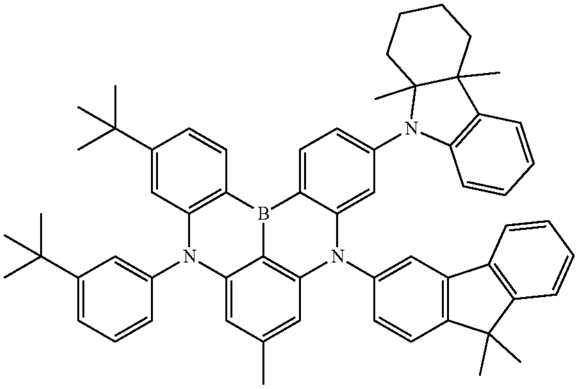
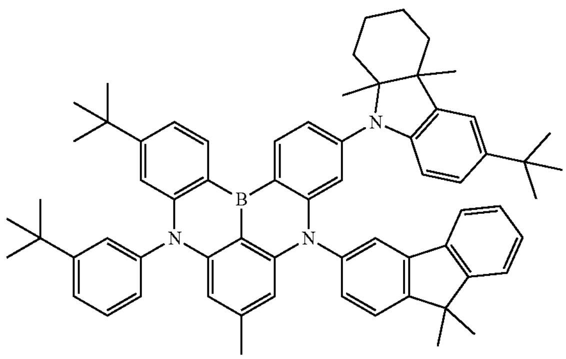

-continued
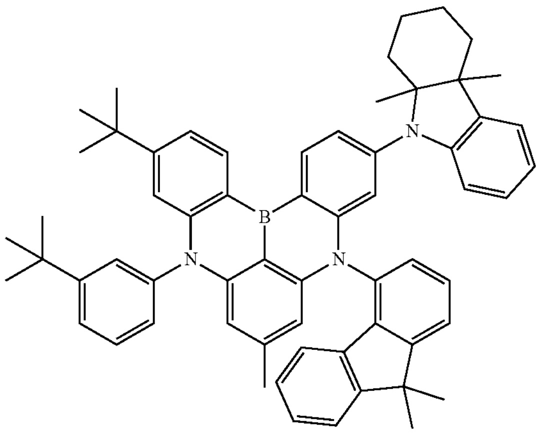
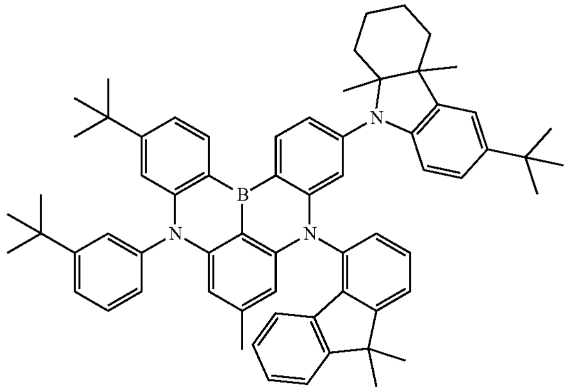
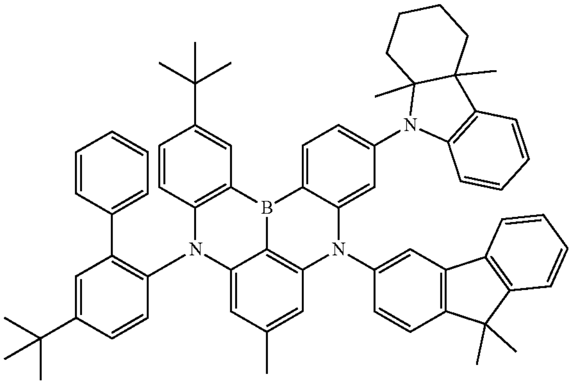
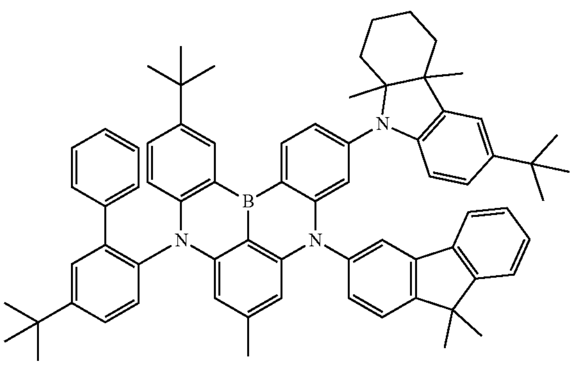
-continued
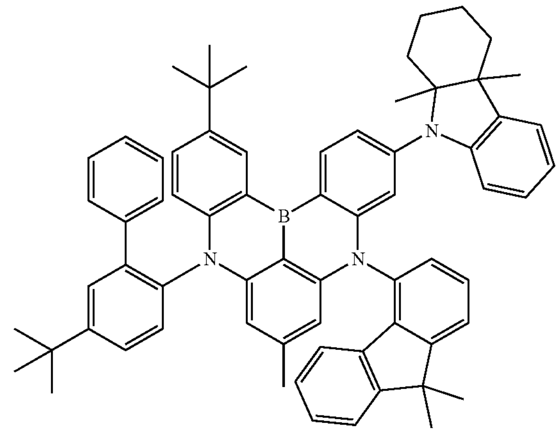
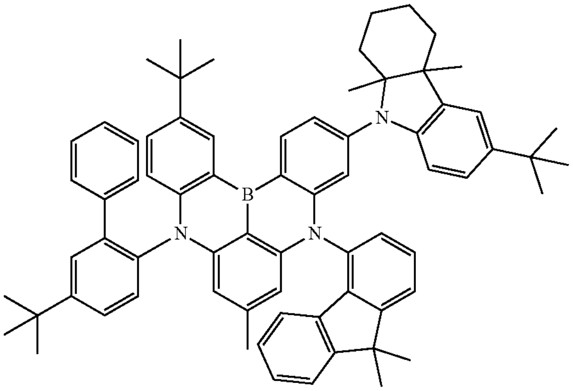
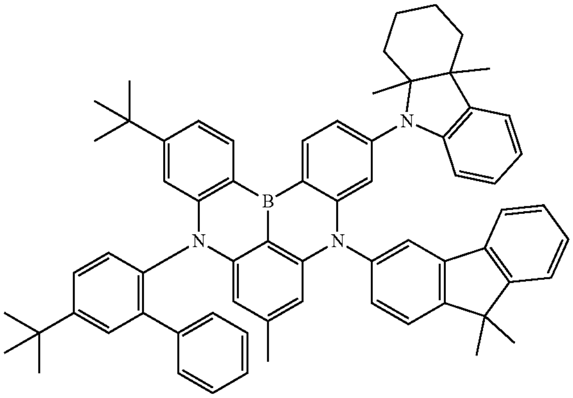
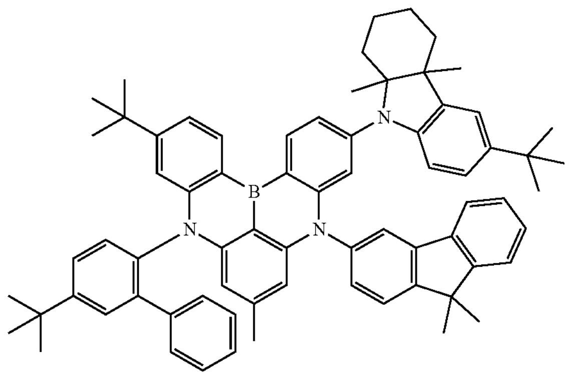

-continued
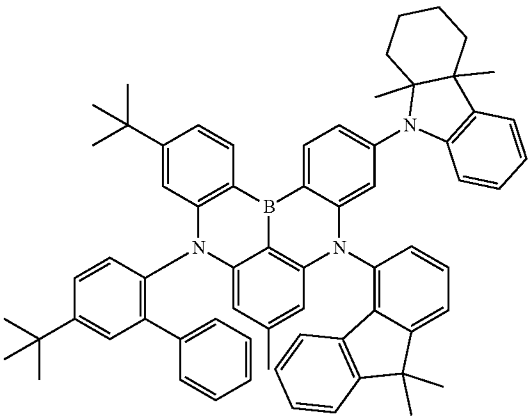
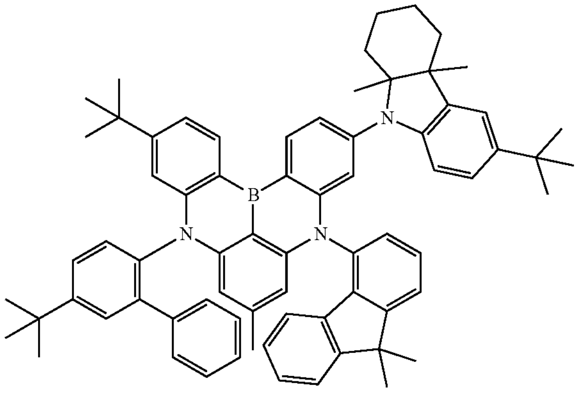
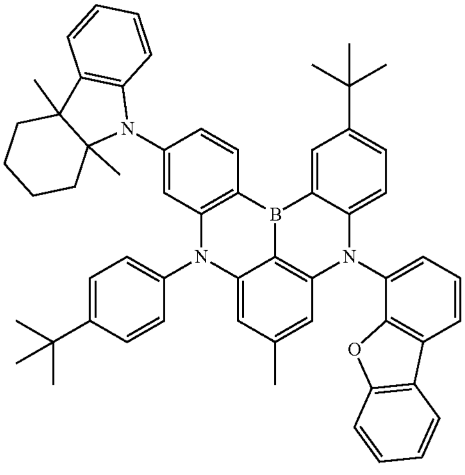
-continued
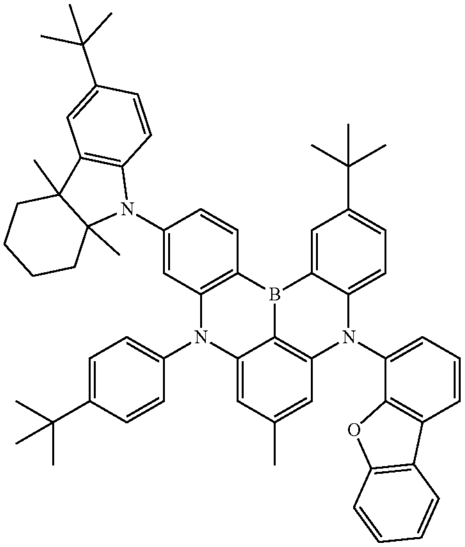
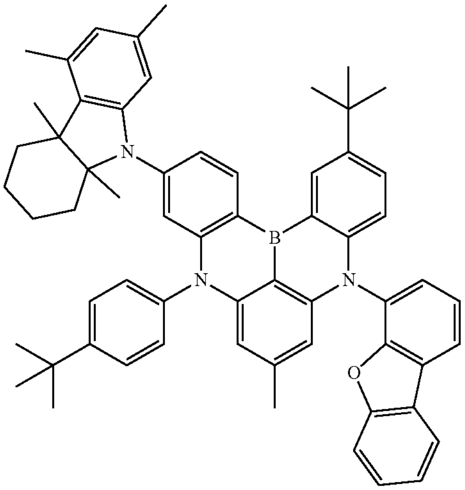
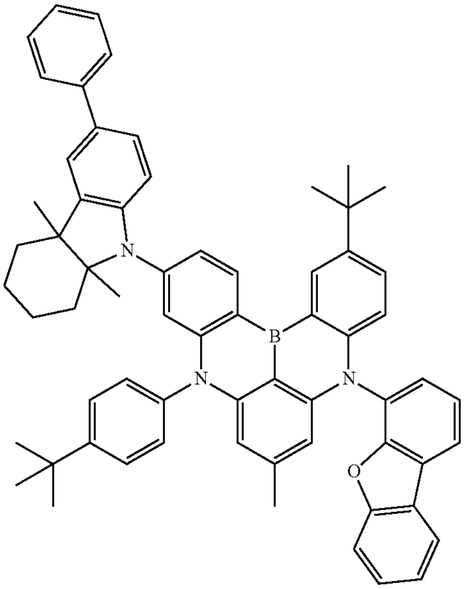

-continued
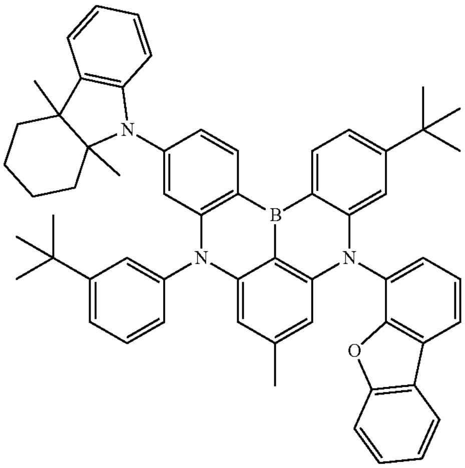
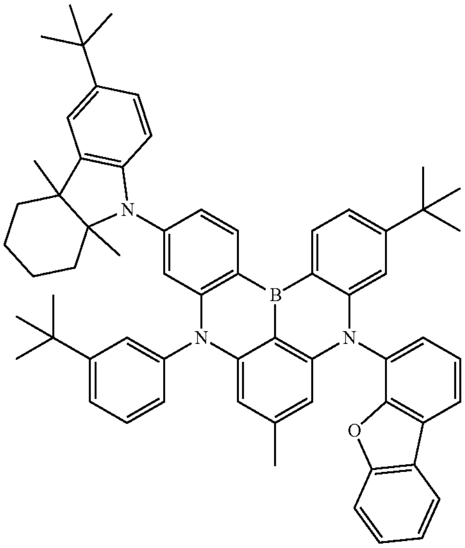
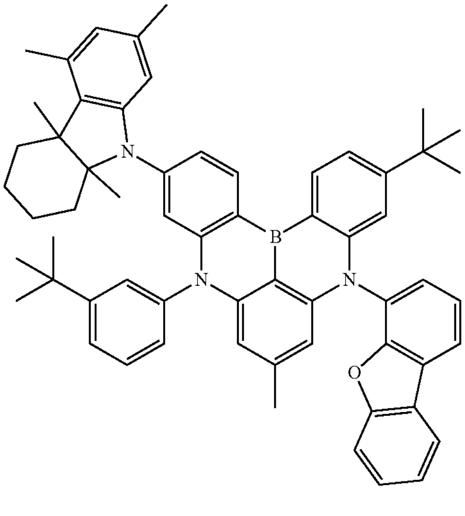
-continued
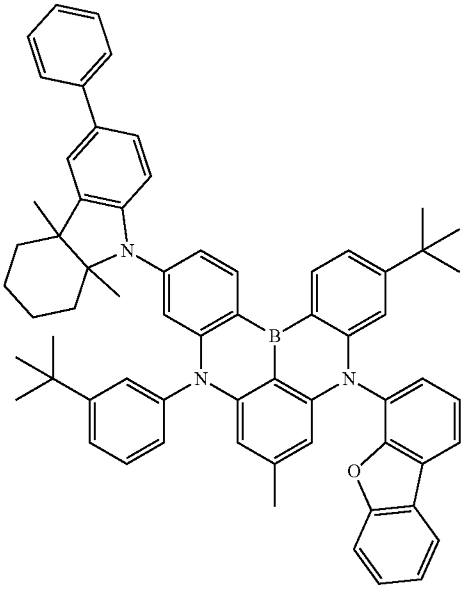
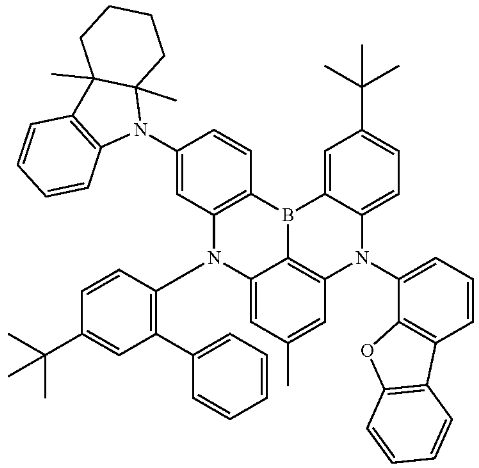
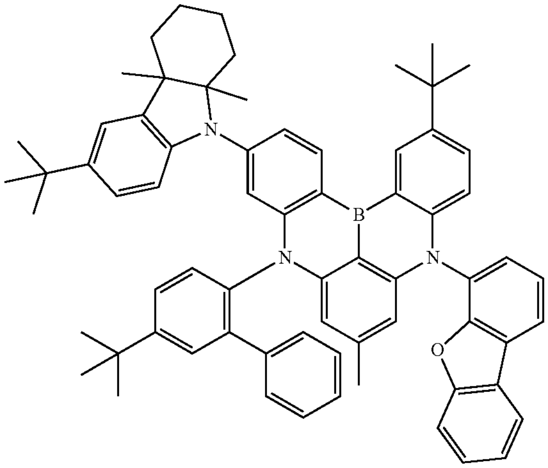

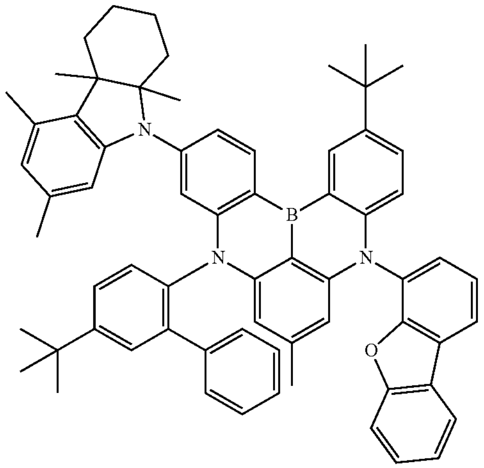
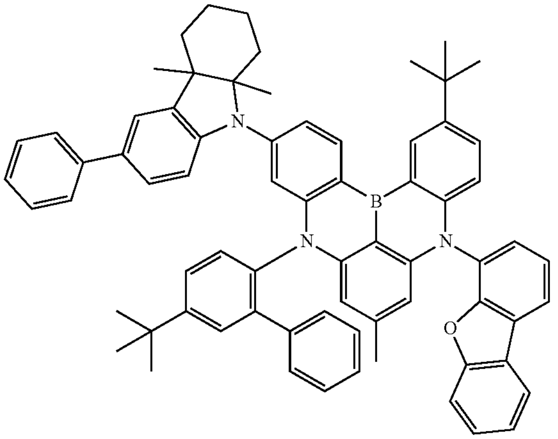
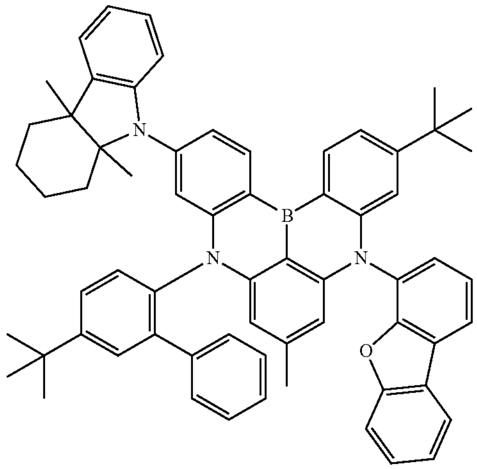
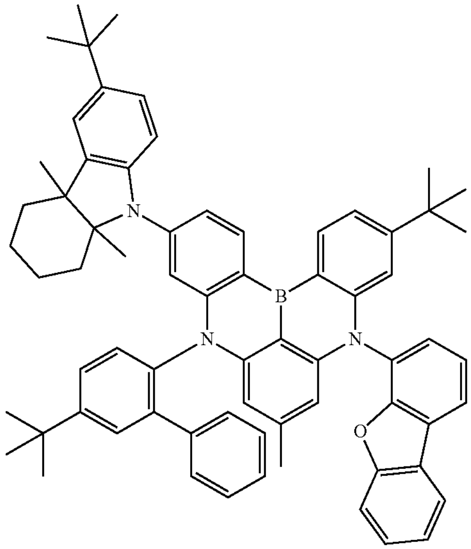
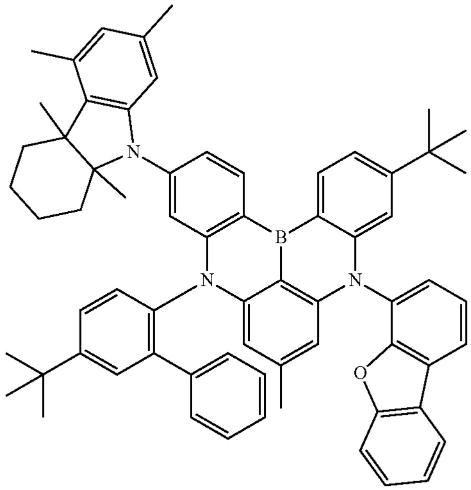
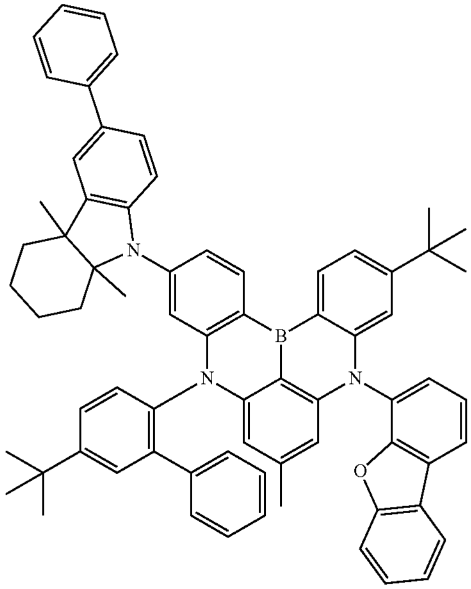

-continued
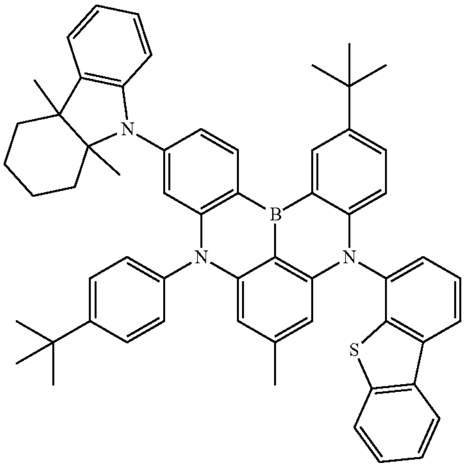
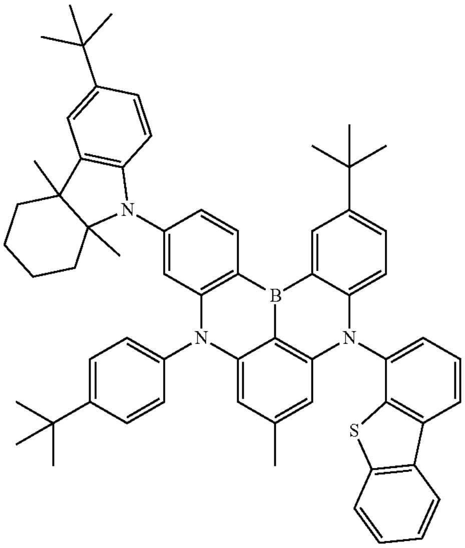
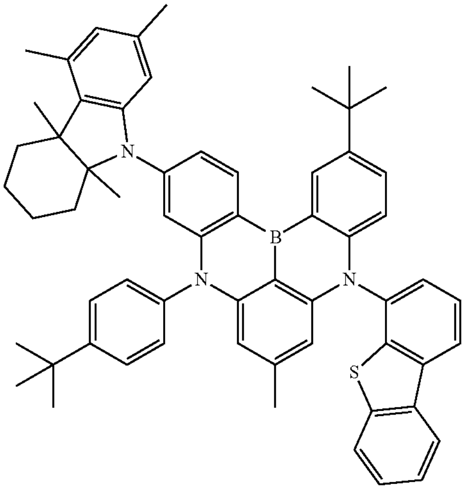
-continued
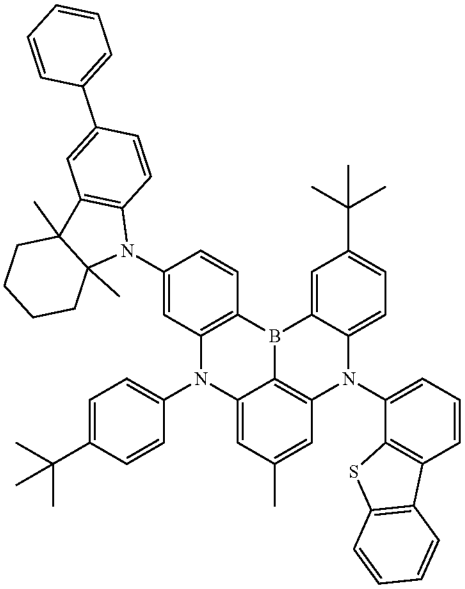
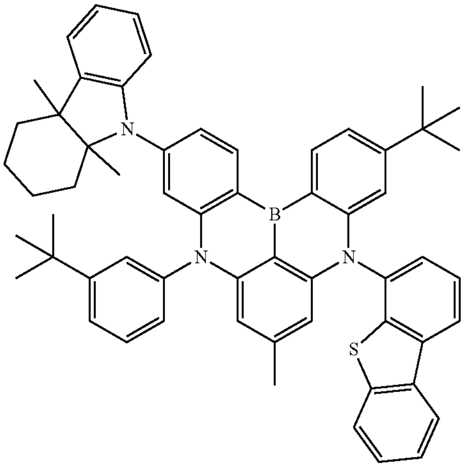
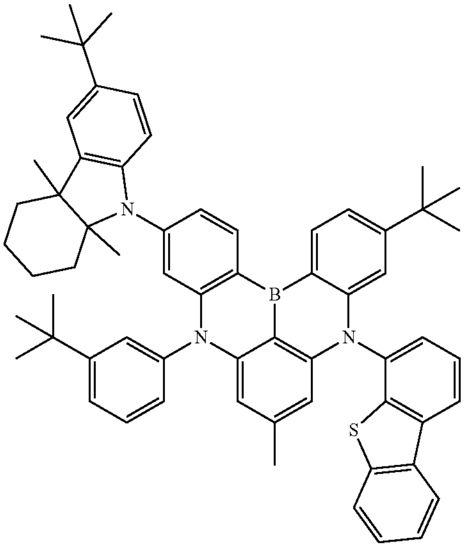

-continued
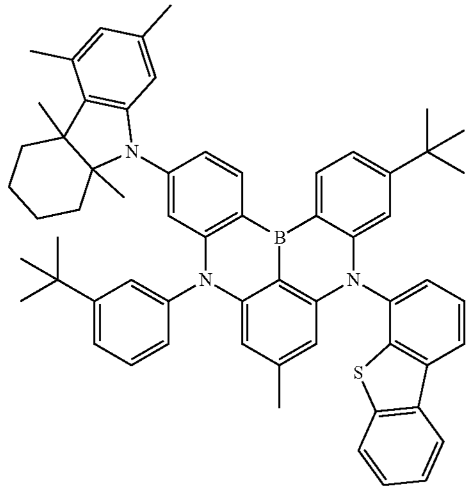
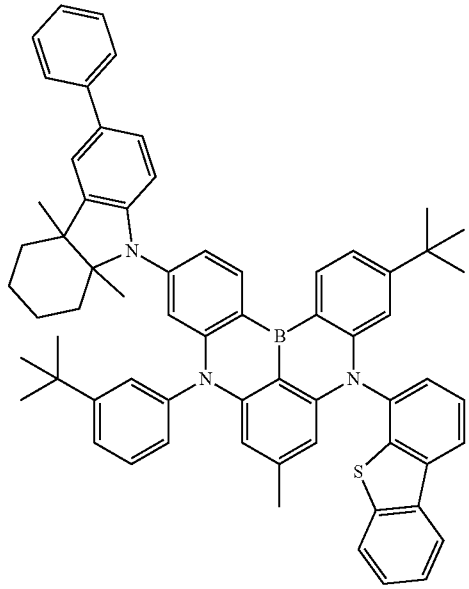
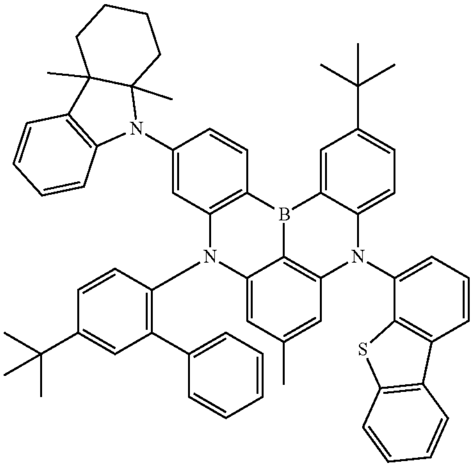
-continued
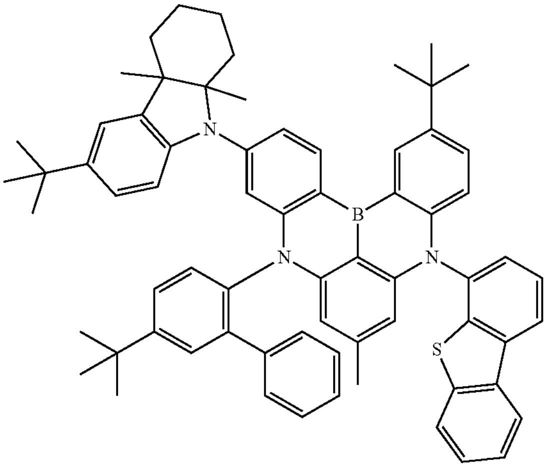
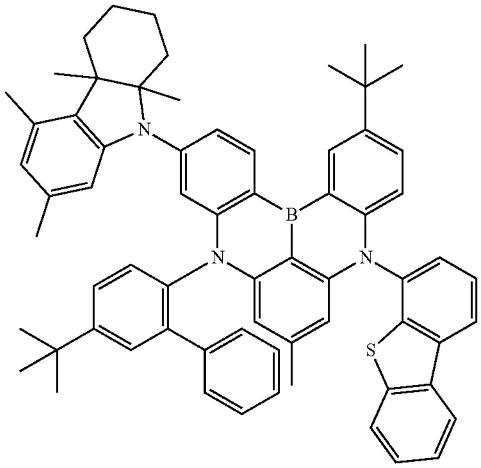
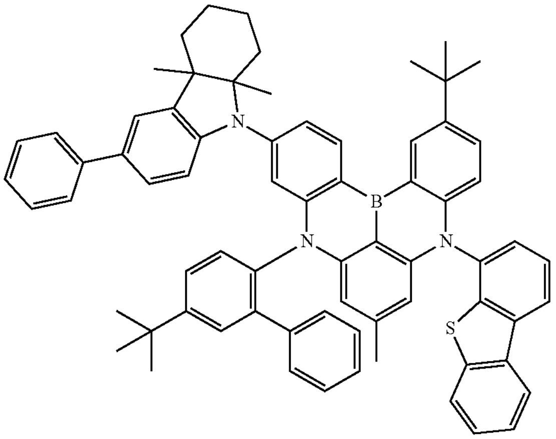

-continued
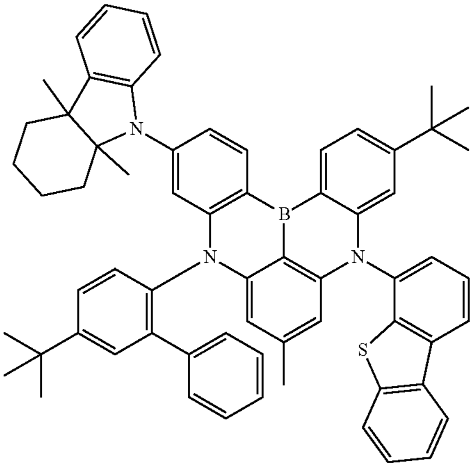
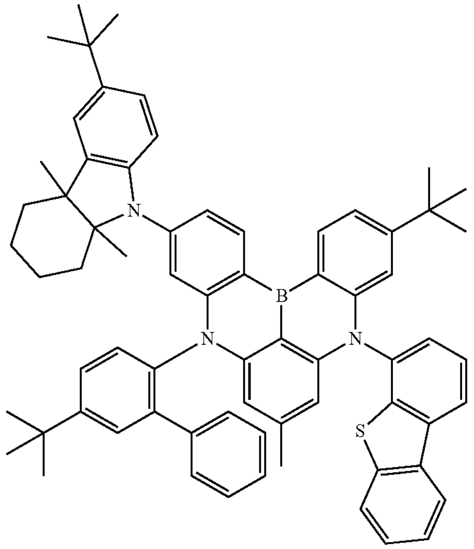
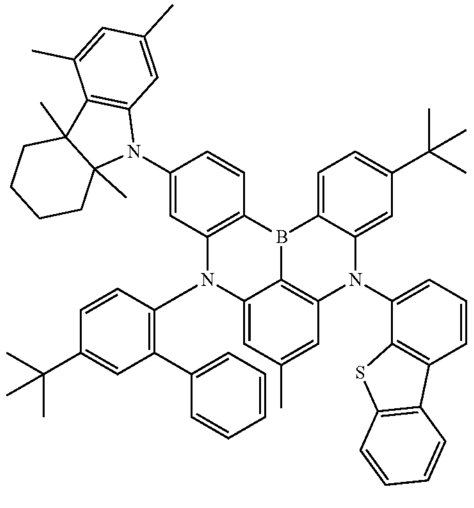
-continued
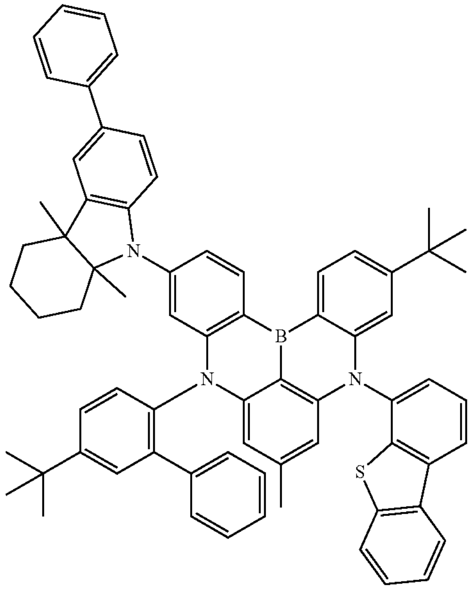
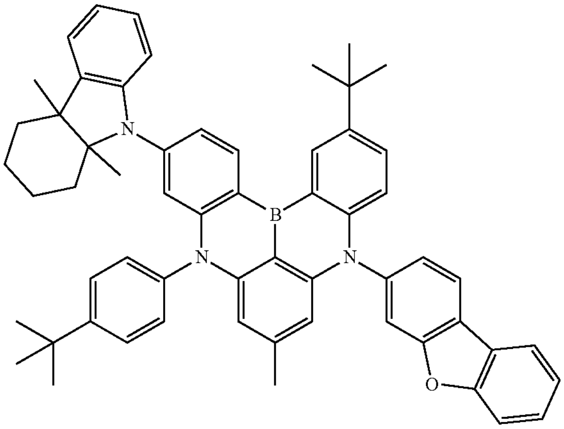
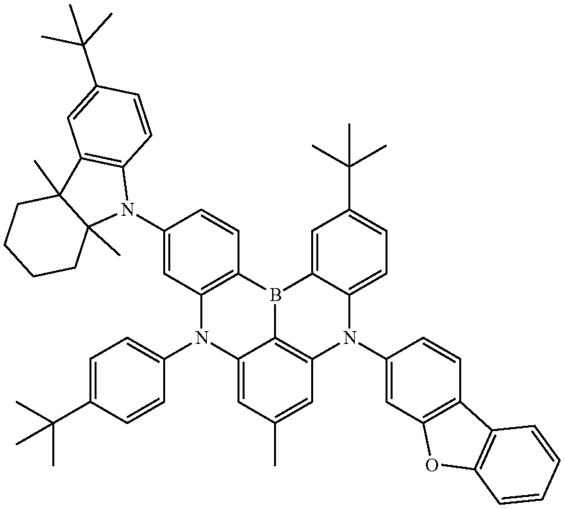

-continued
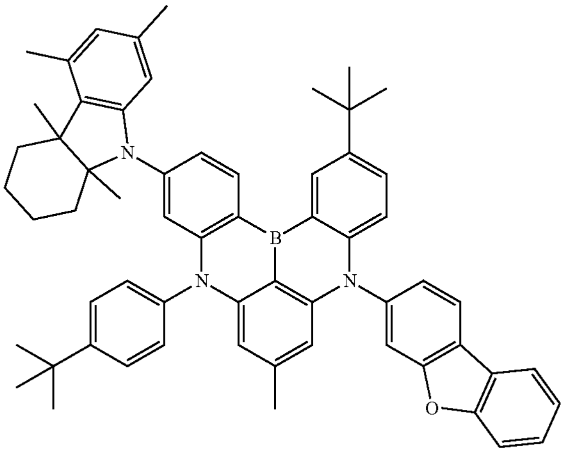
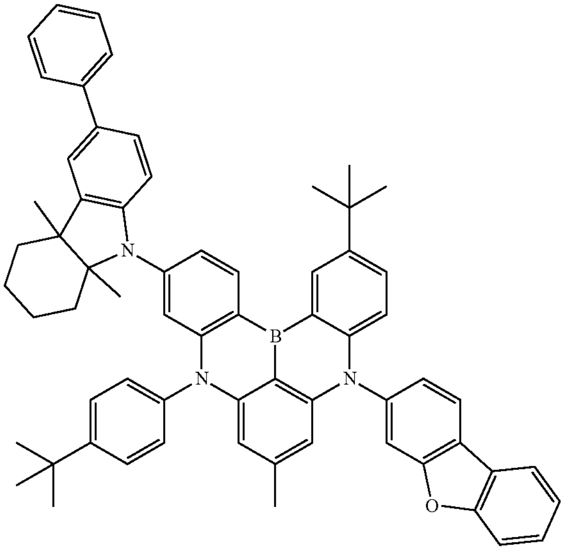
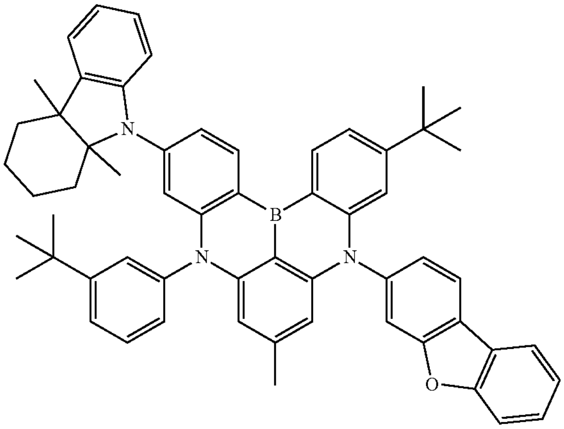
-continued
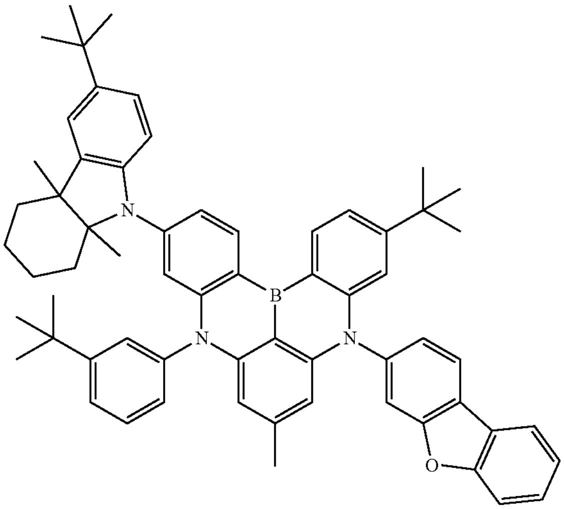
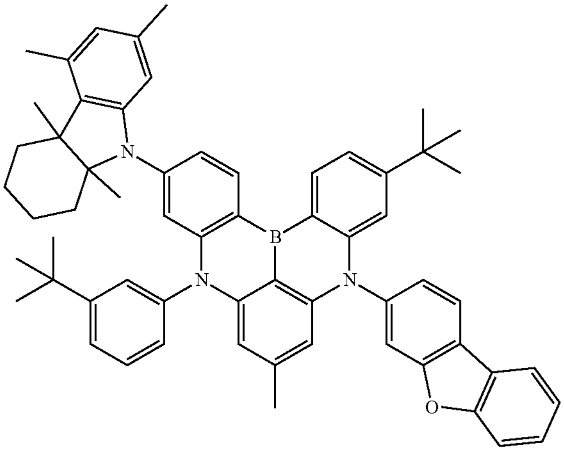
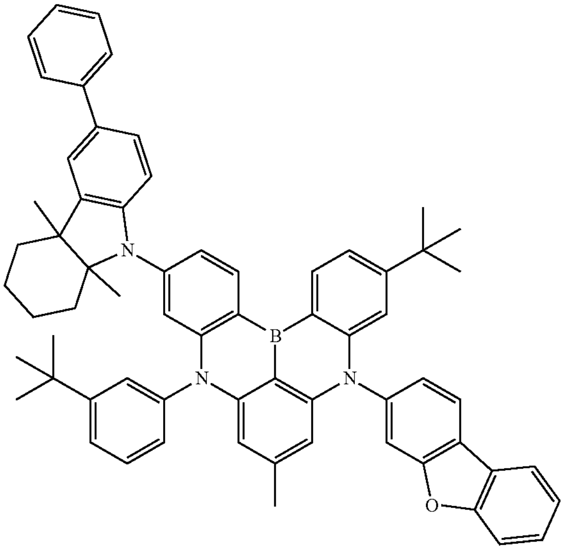

-continued
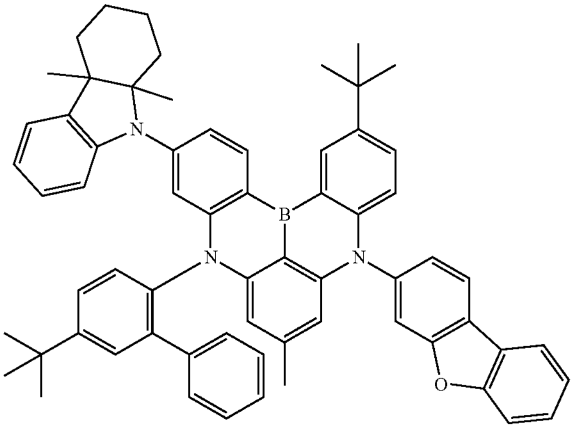
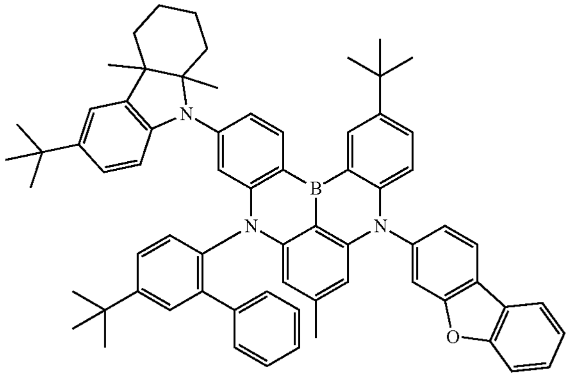
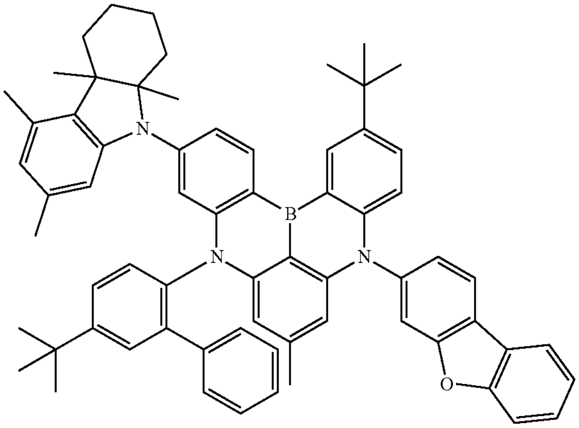
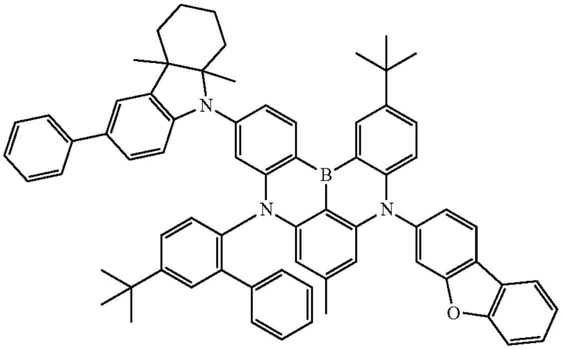
-continued
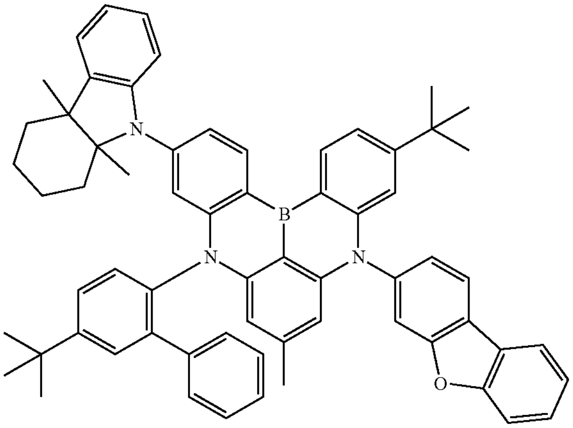
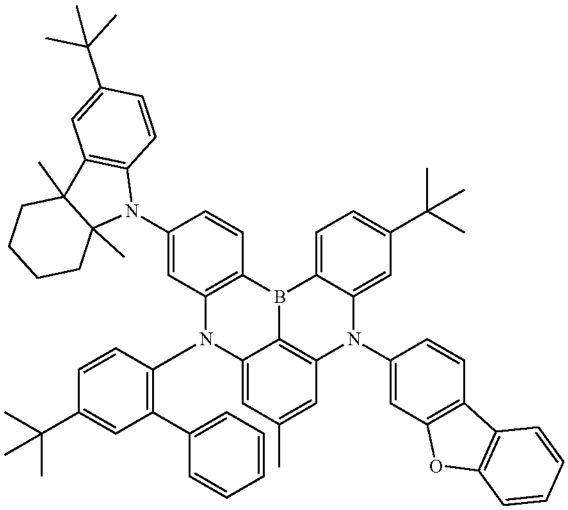
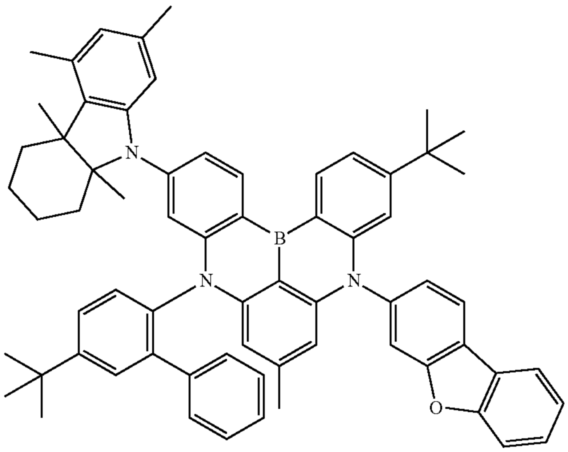

-continued
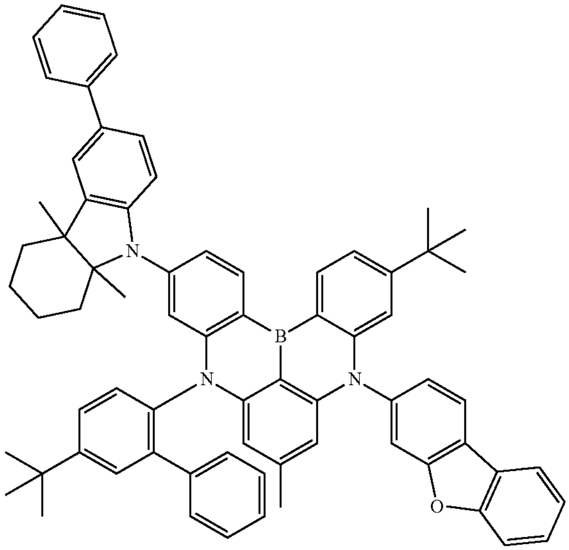
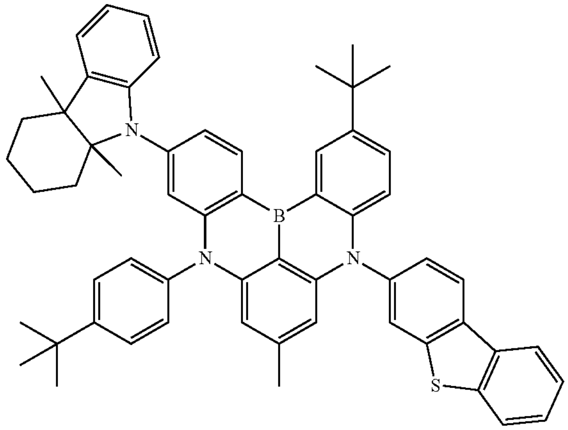
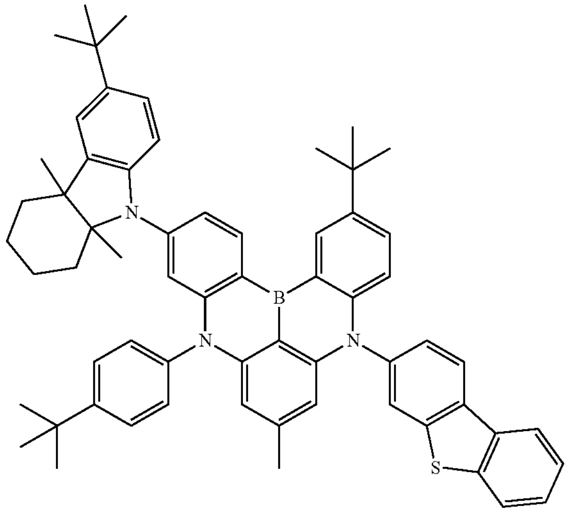
-continued
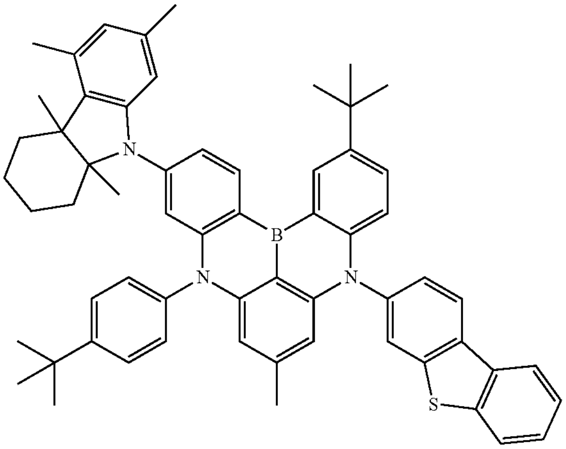
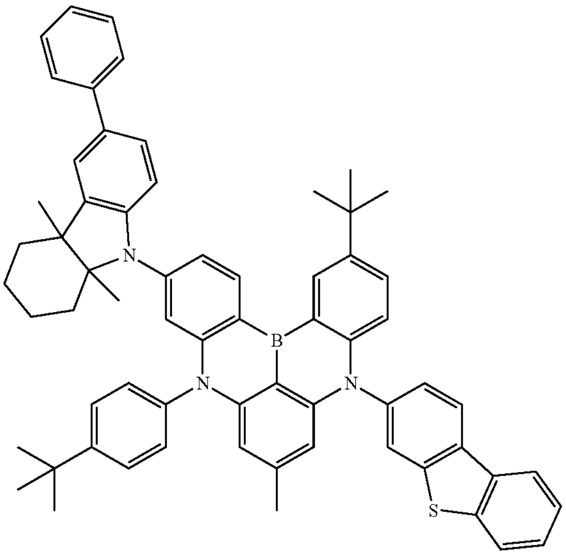
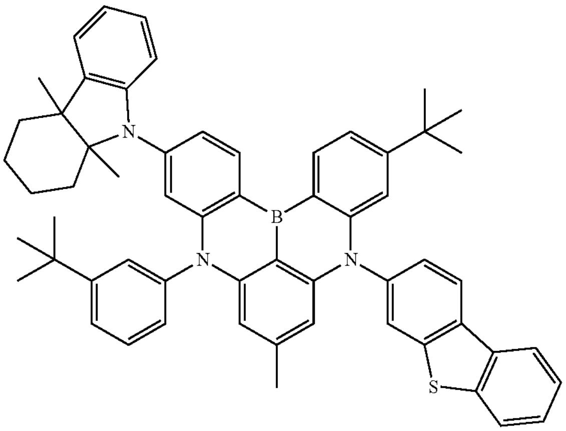

-continued
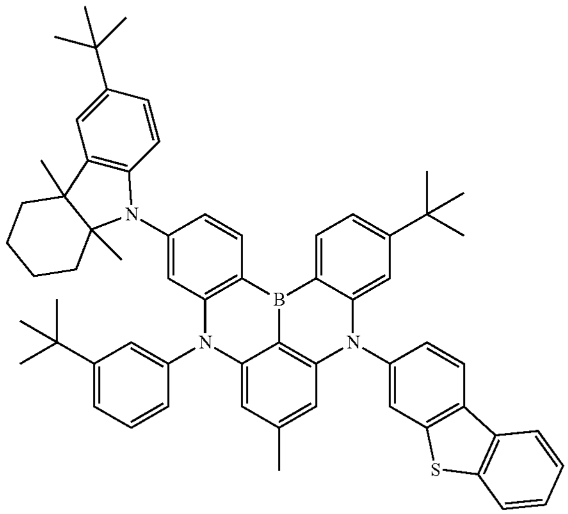
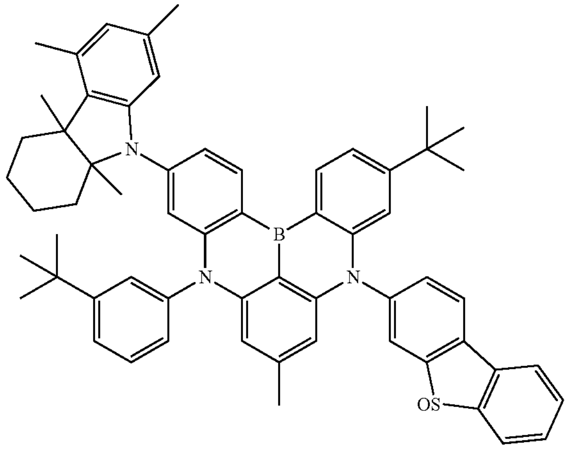
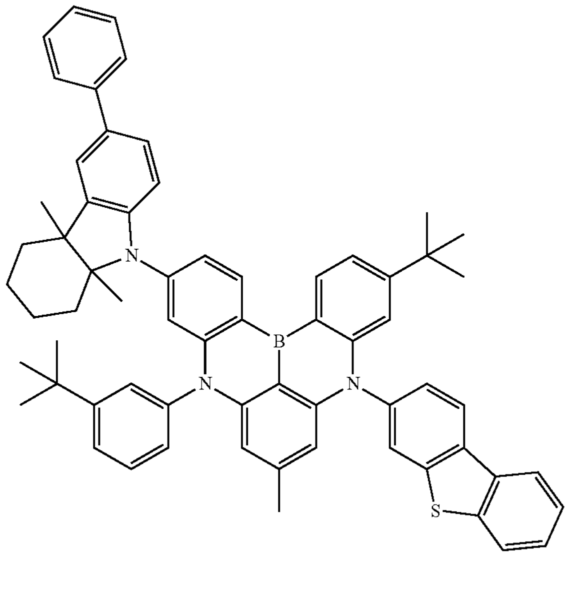
-continued
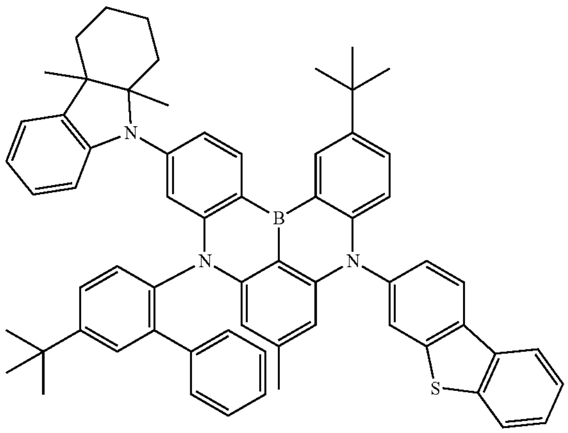
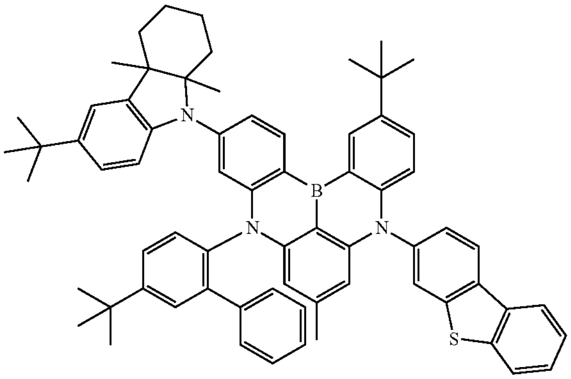
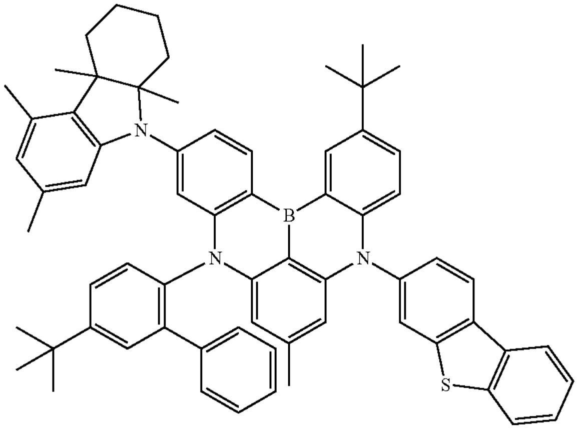
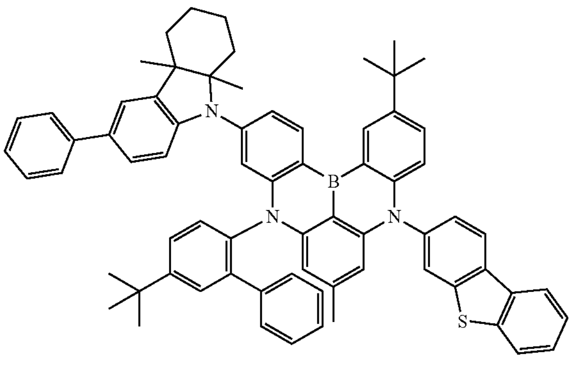

-continued
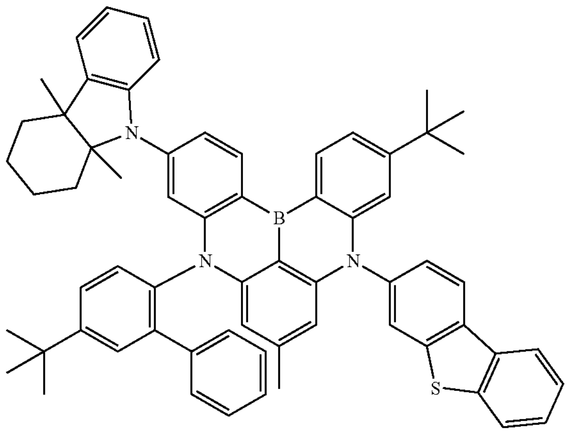
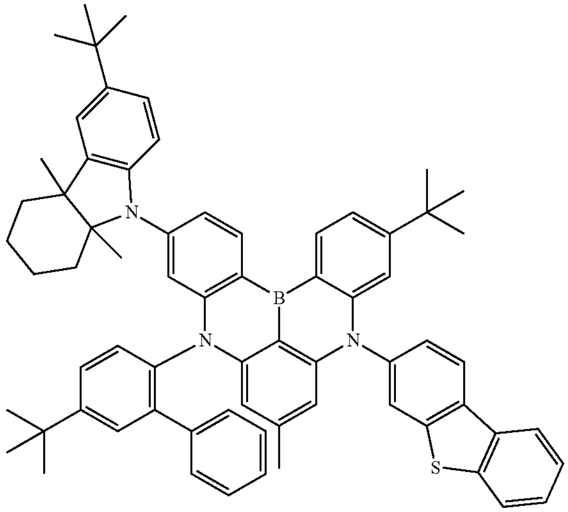
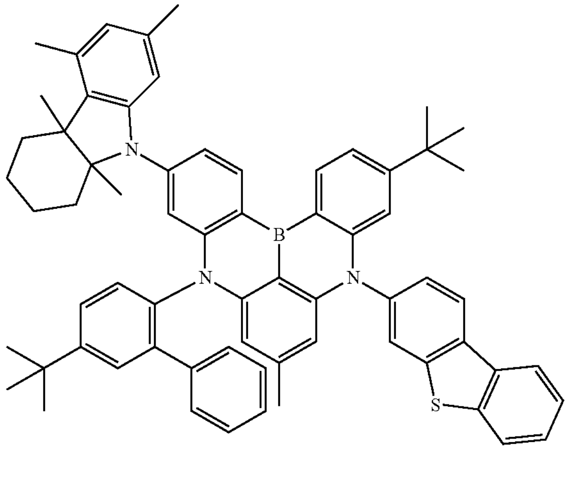
-continued
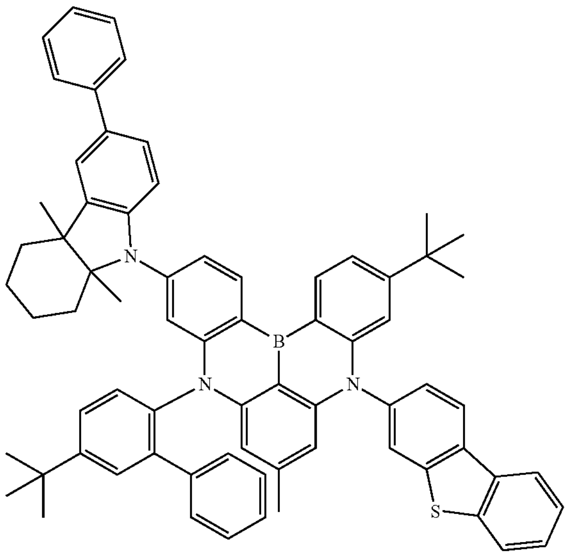
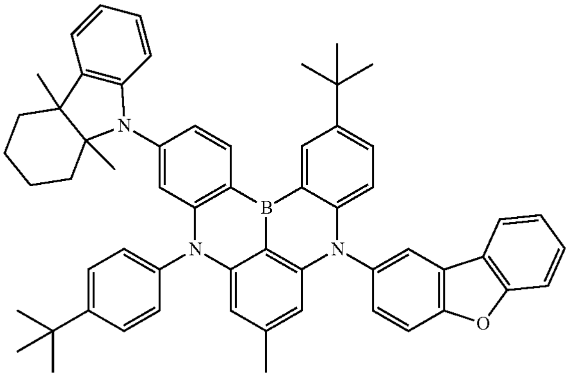
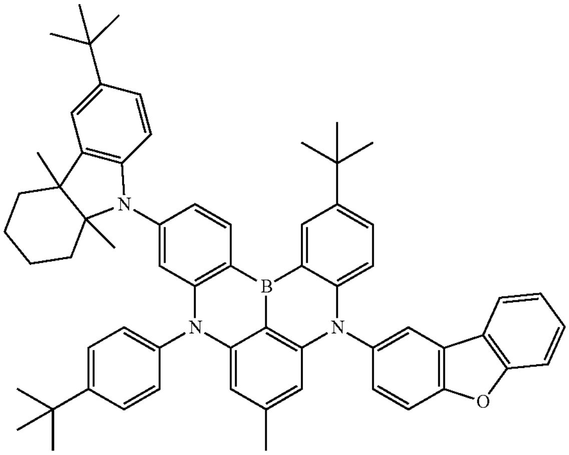

-continued
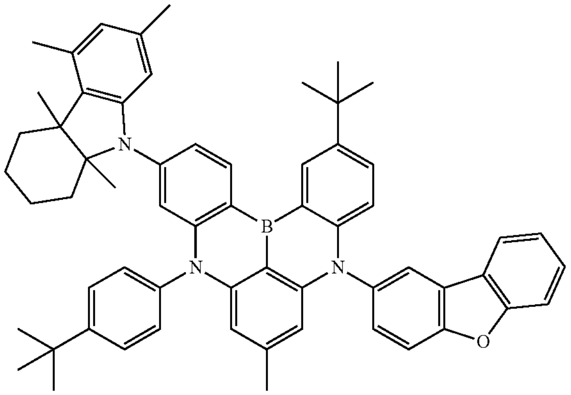
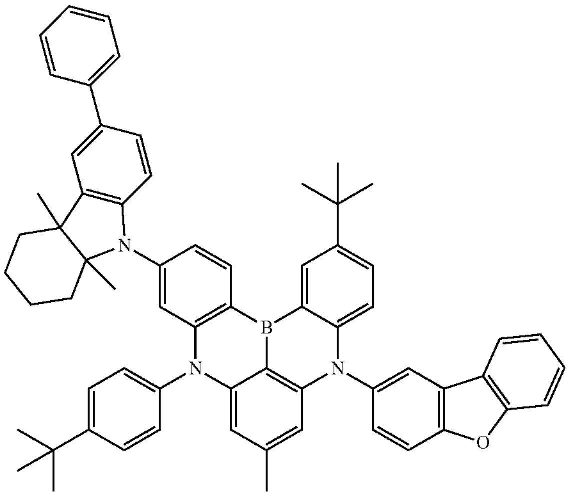
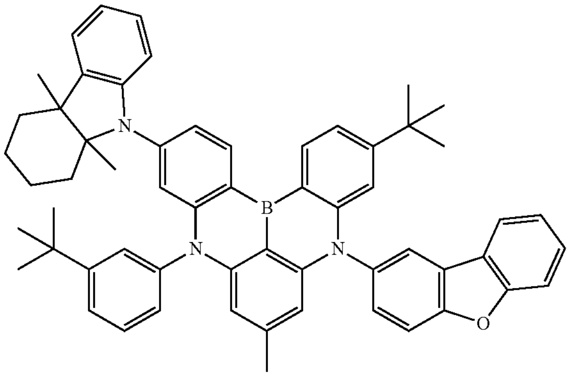
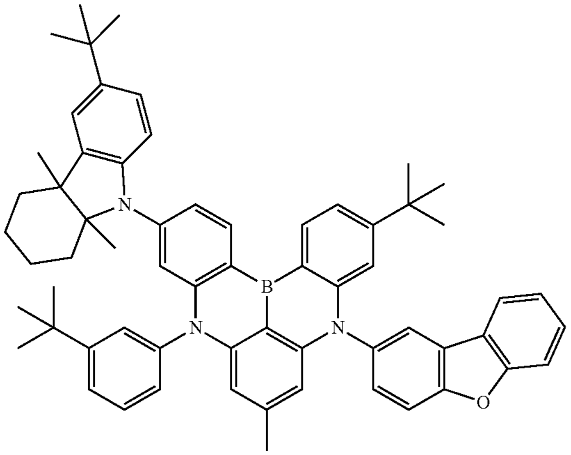
-continued
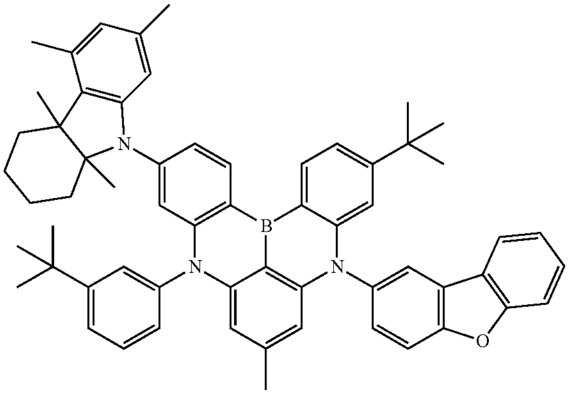
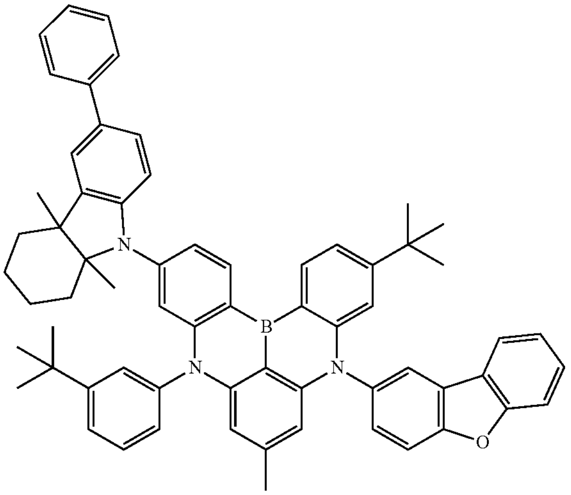
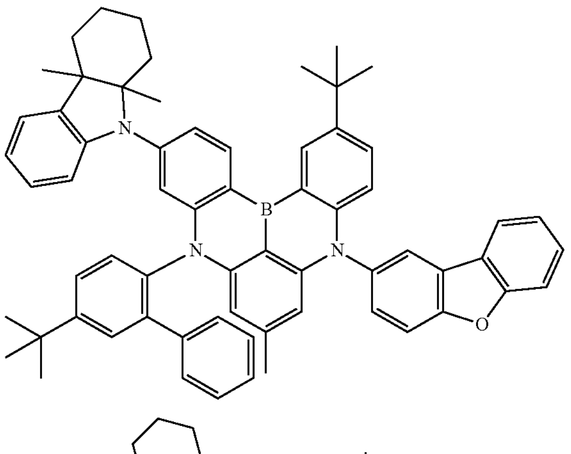
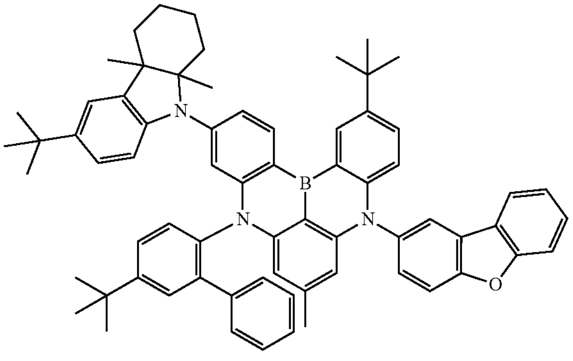

-continued
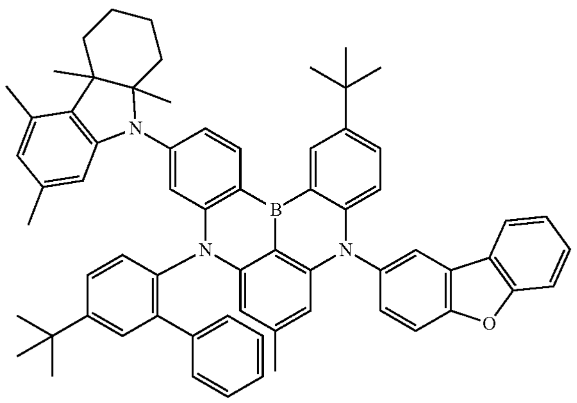
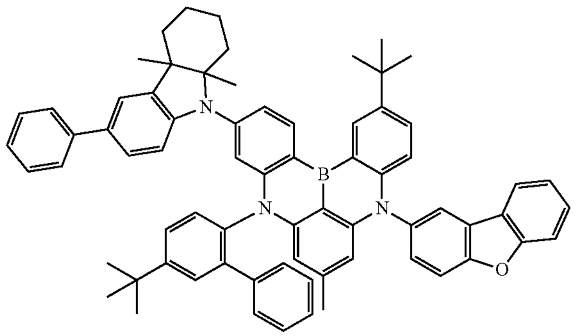
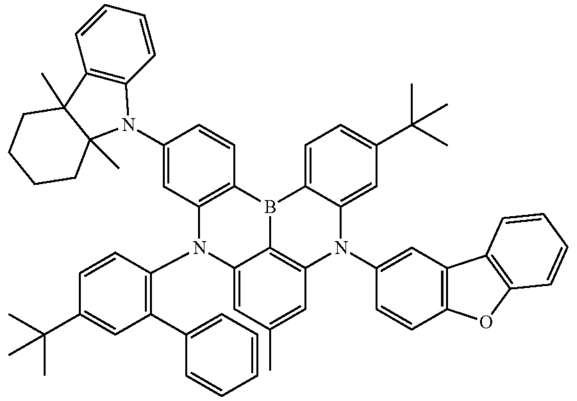
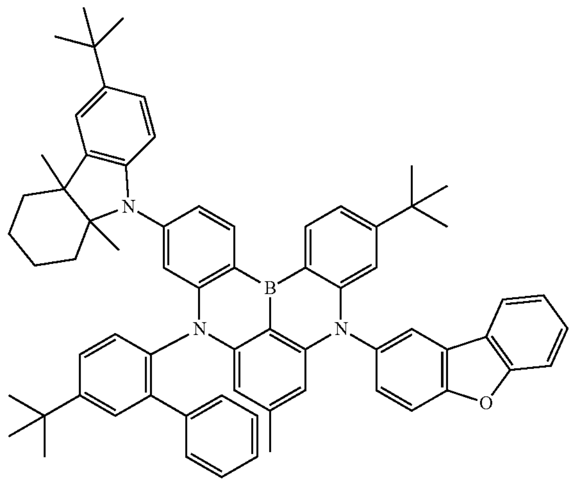
-continued
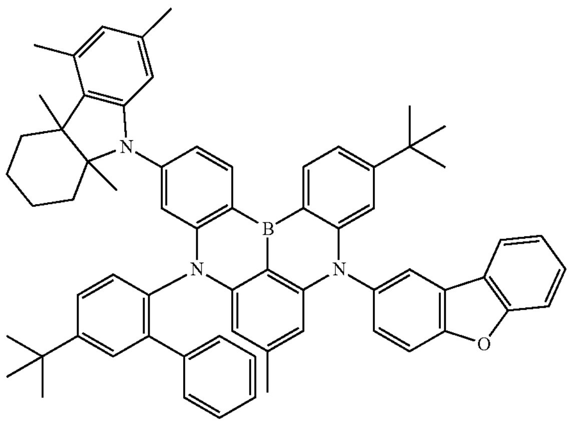
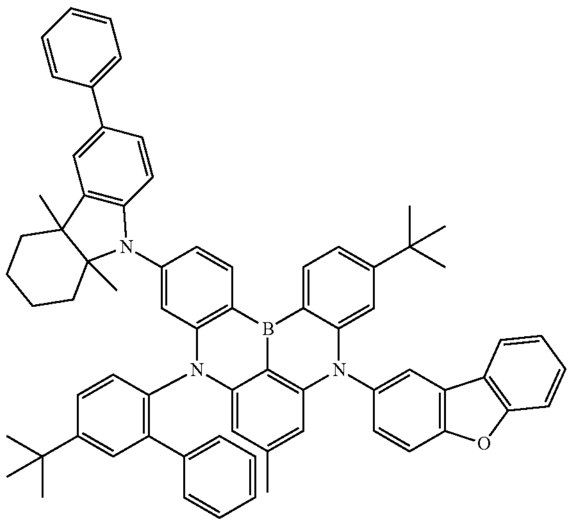
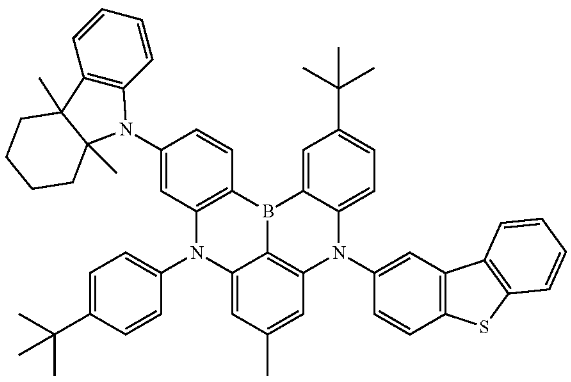

-continued
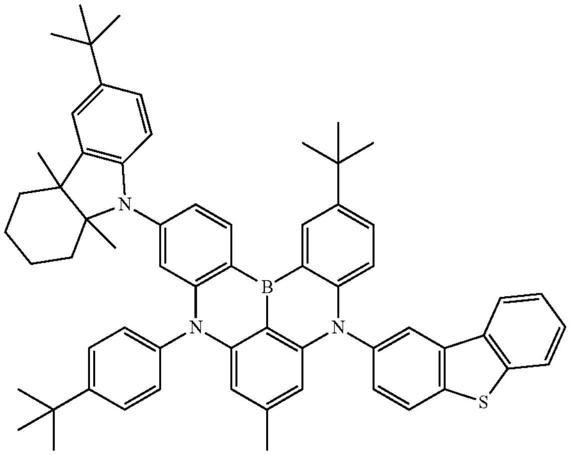
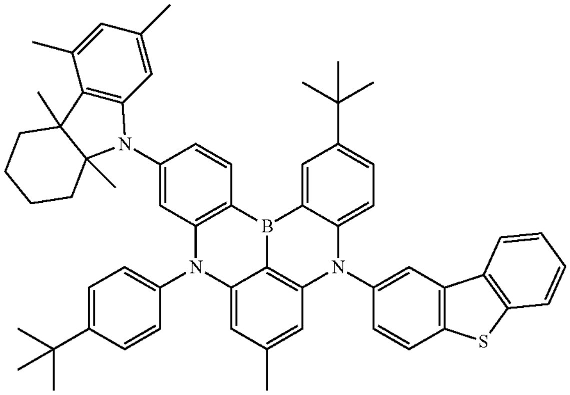
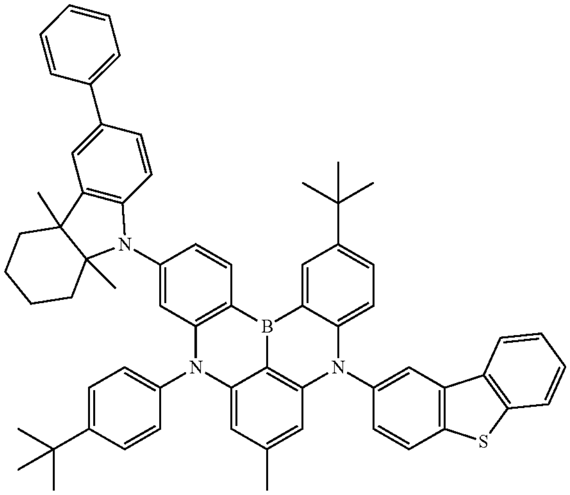
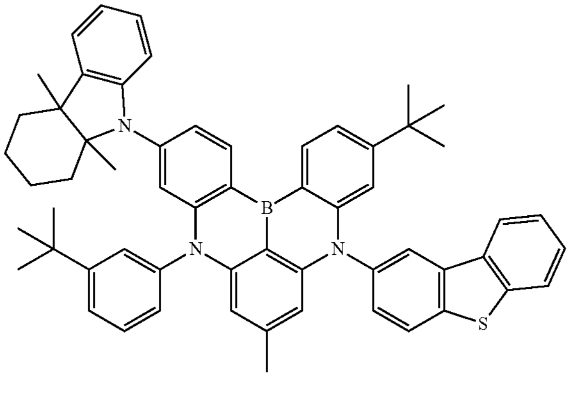
-continued
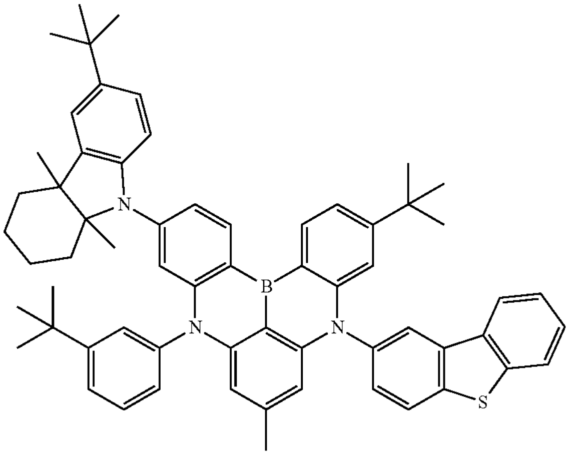
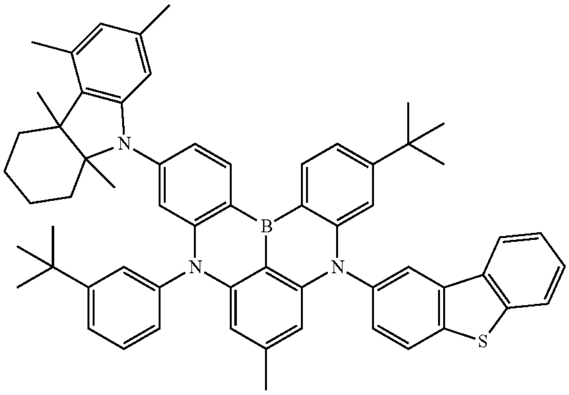
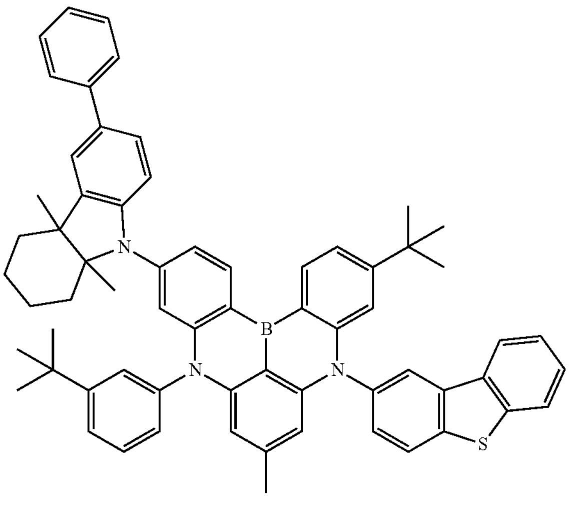

-continued
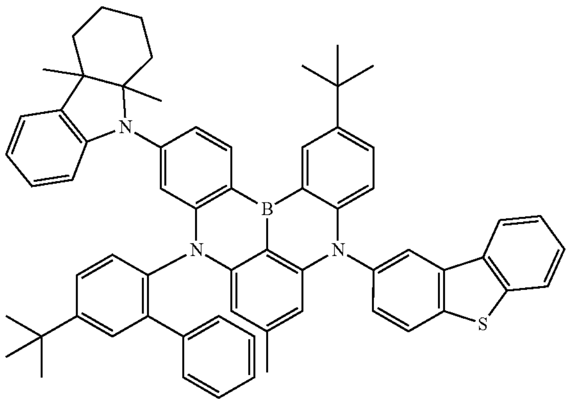
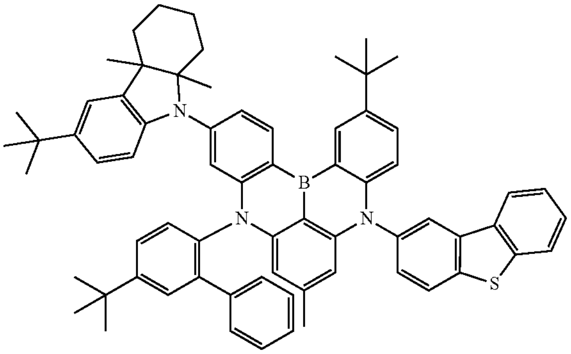
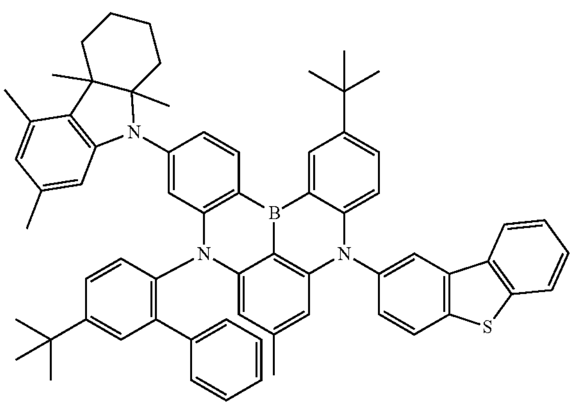
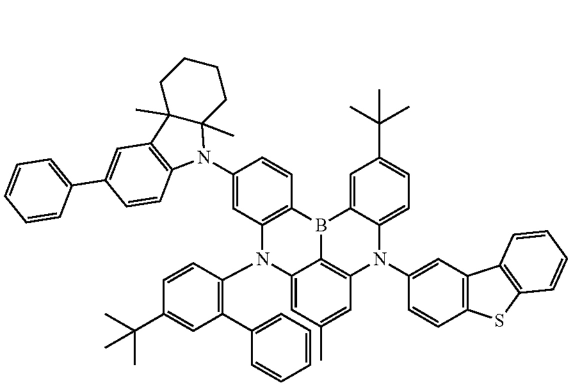
-continued
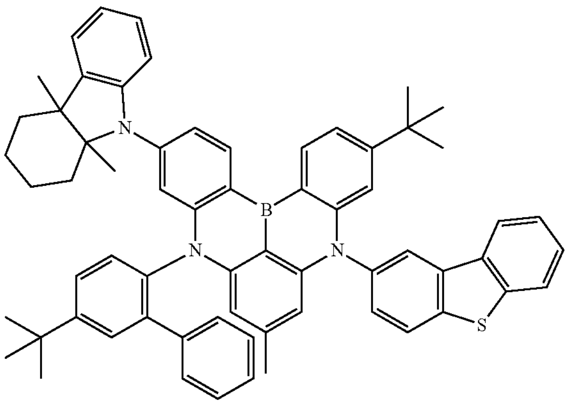
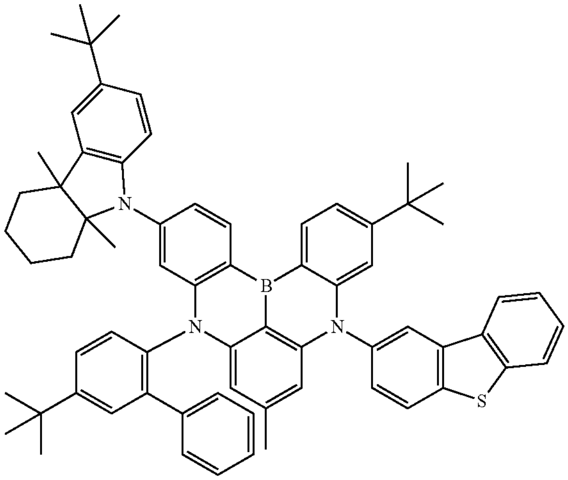
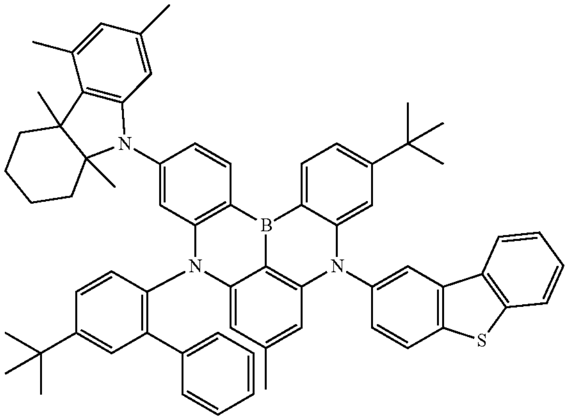

-continued
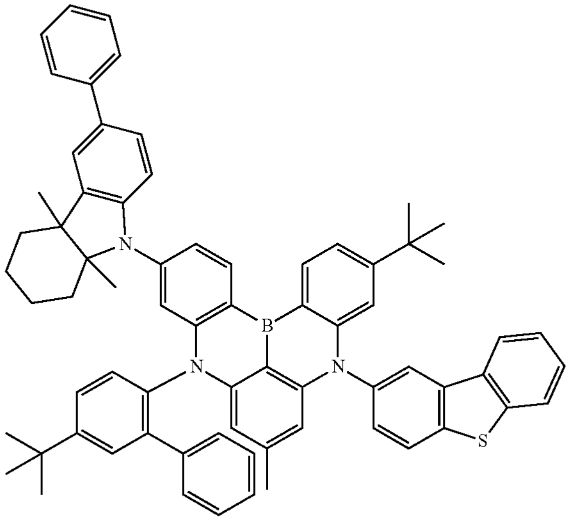
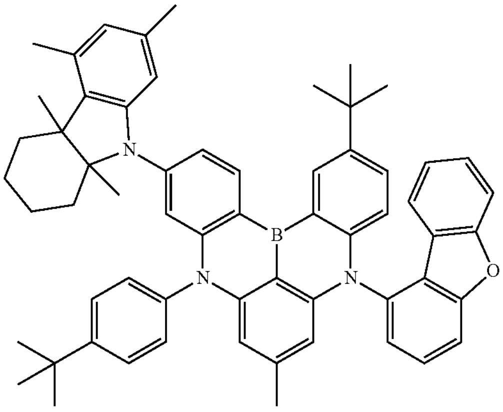
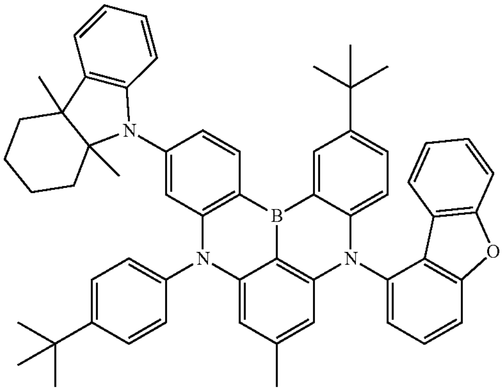
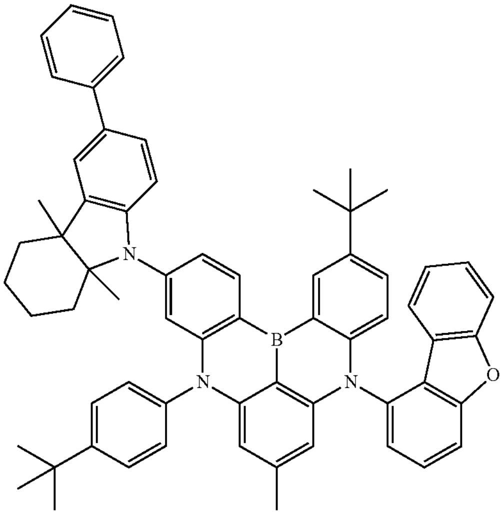
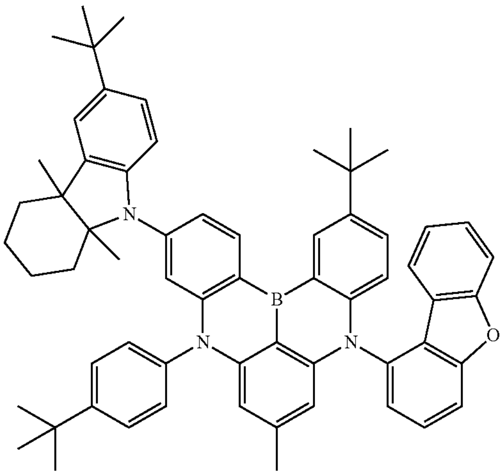
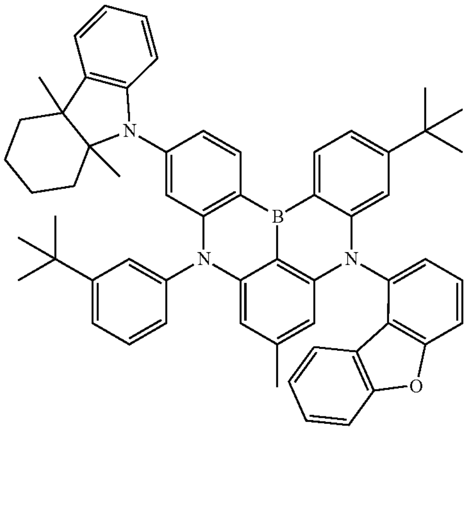
-continued -continued
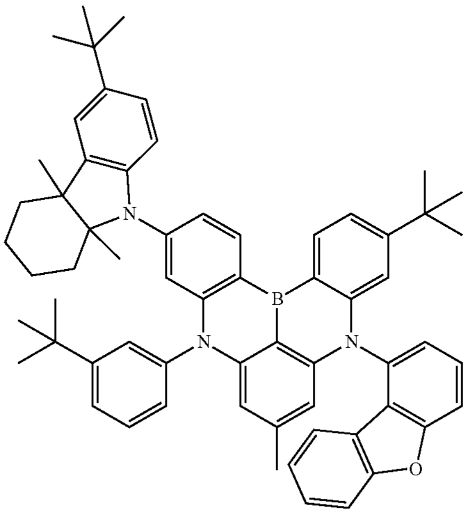
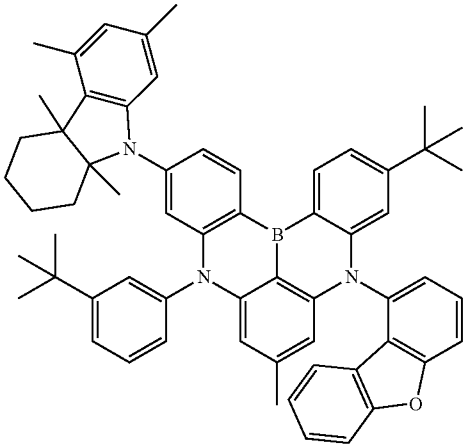
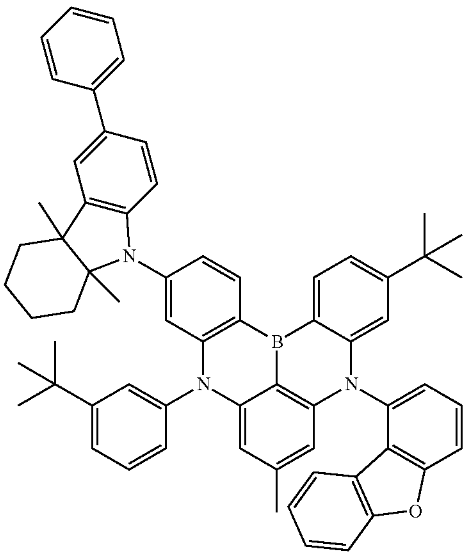
-continued
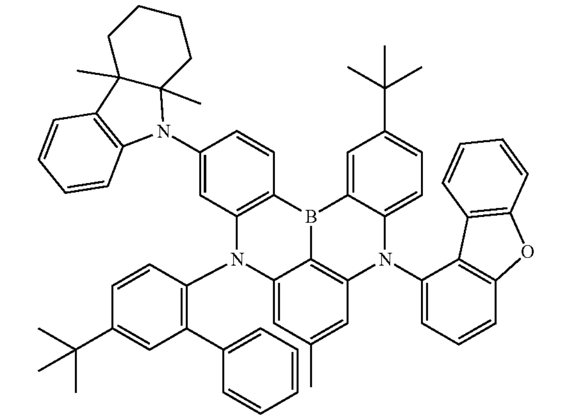
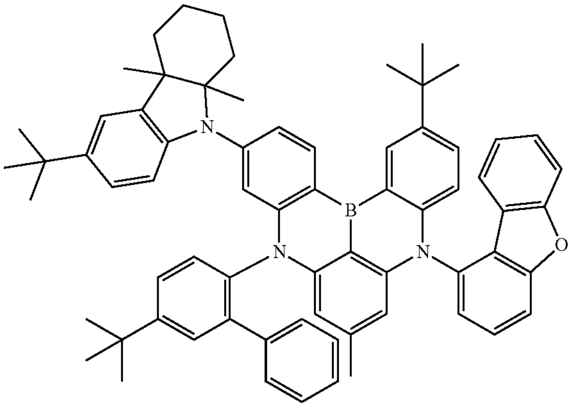
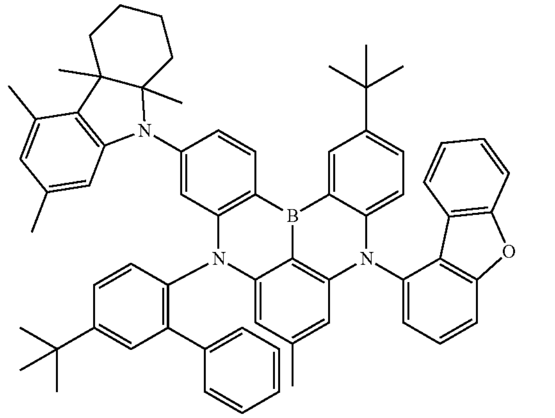
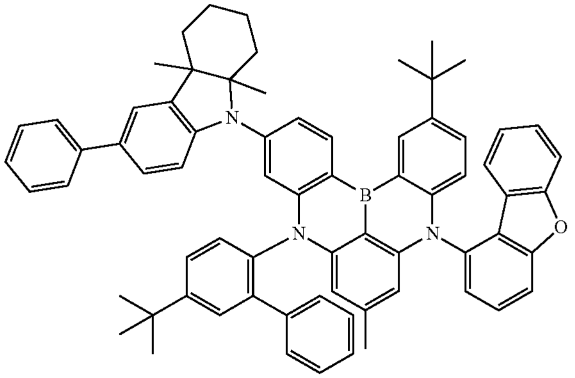

-continued
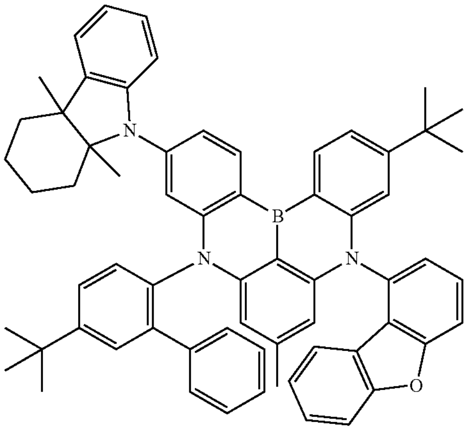
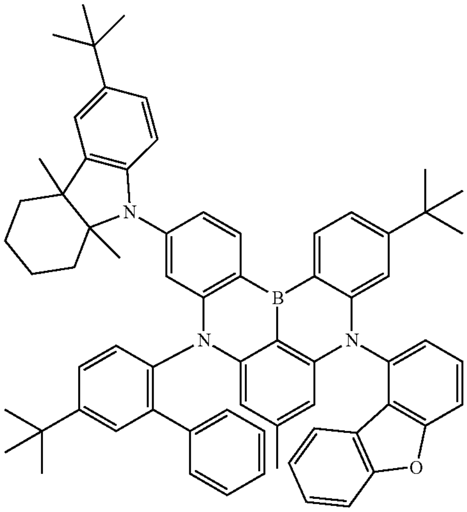
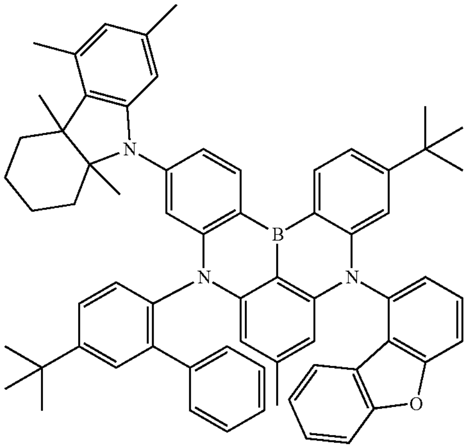
-continued
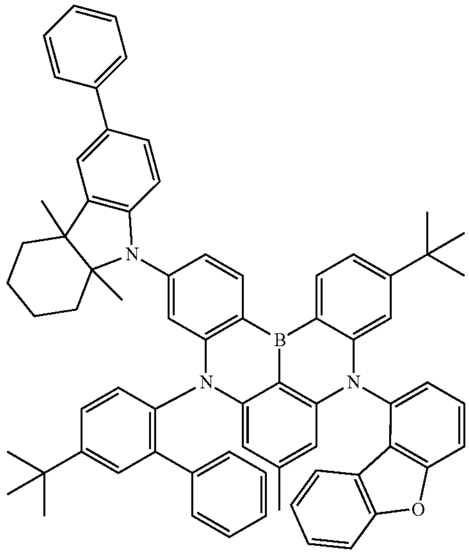
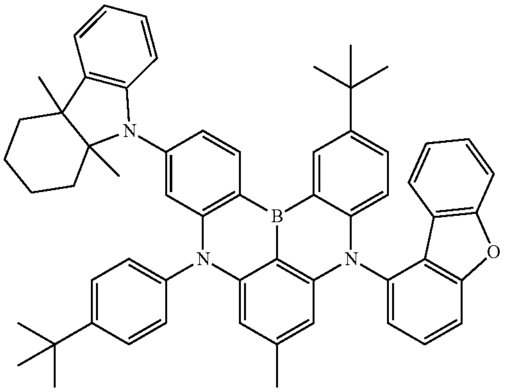
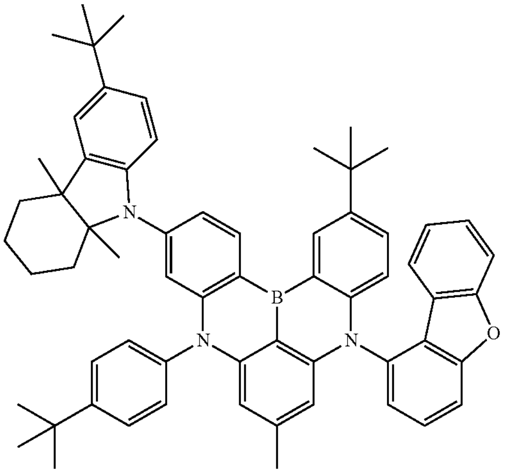

-continued
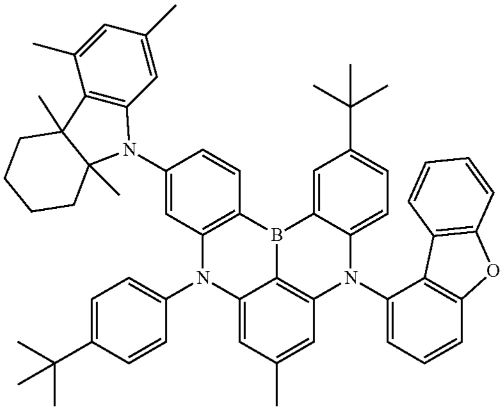
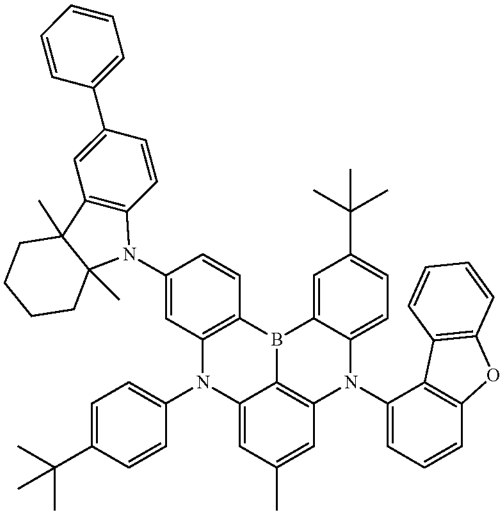
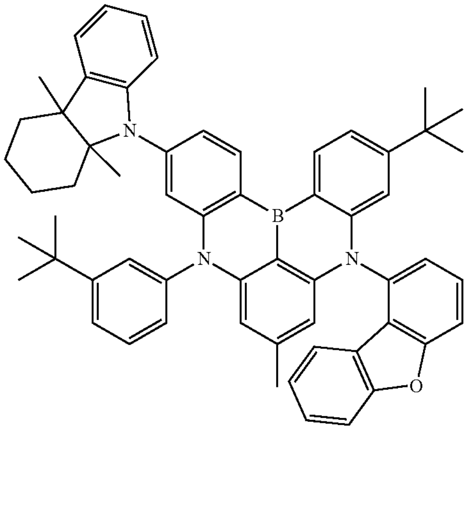
-continued
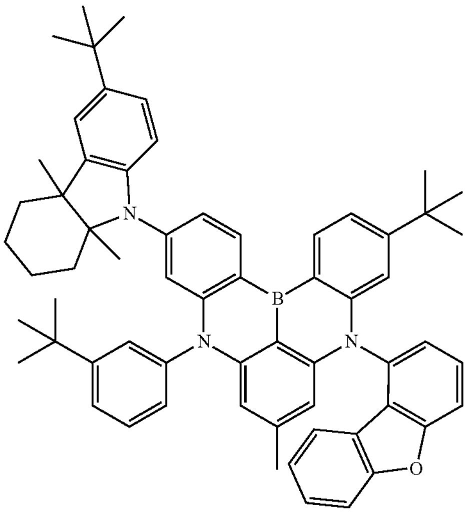
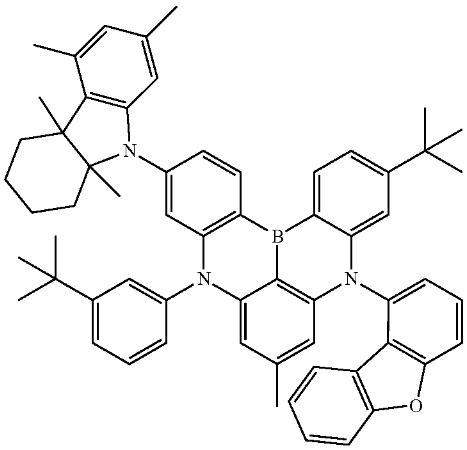
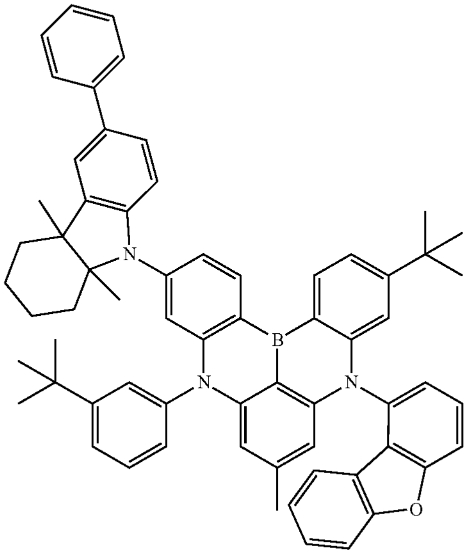

-continued
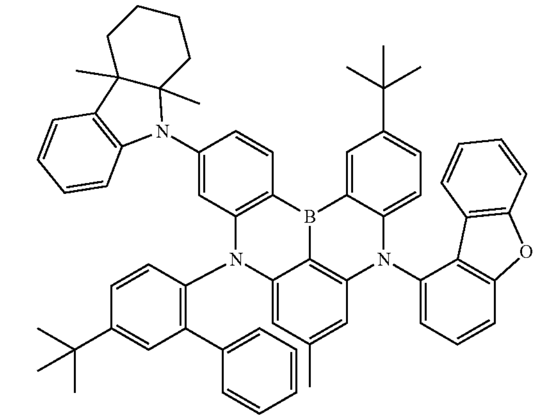
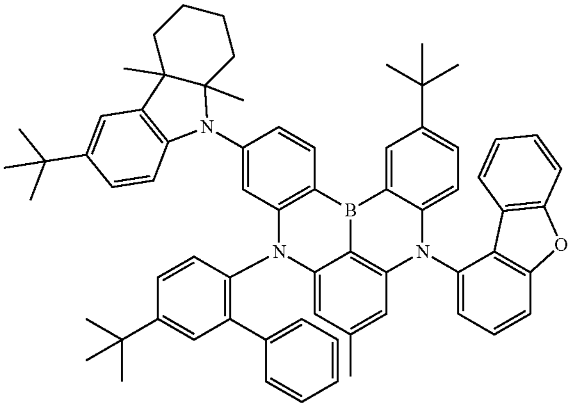
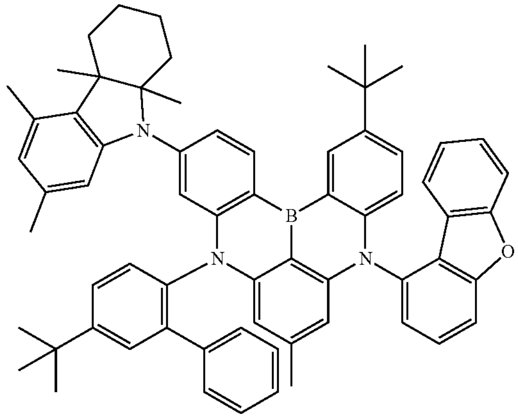
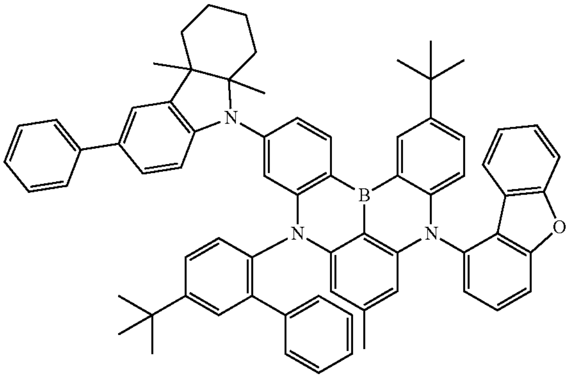
-continued
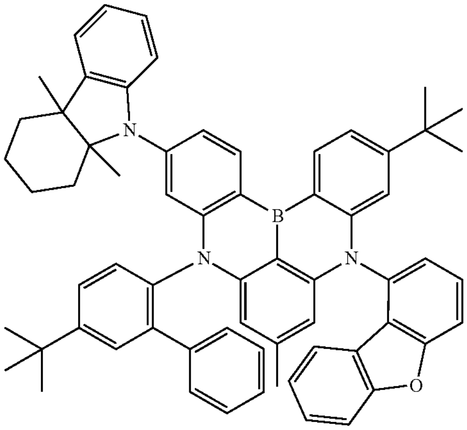
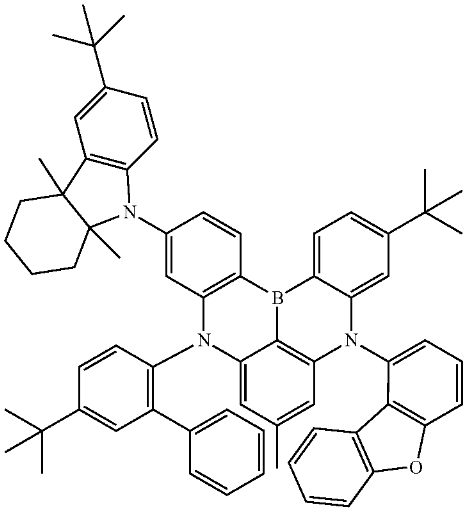
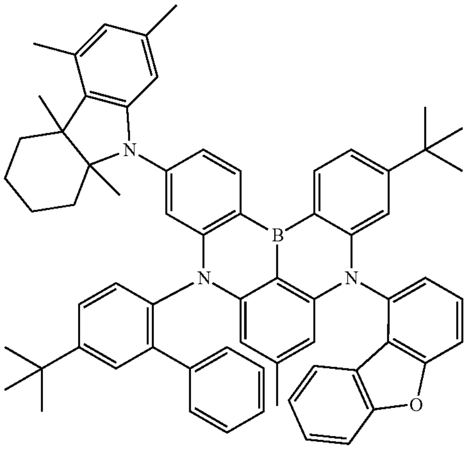

-continued
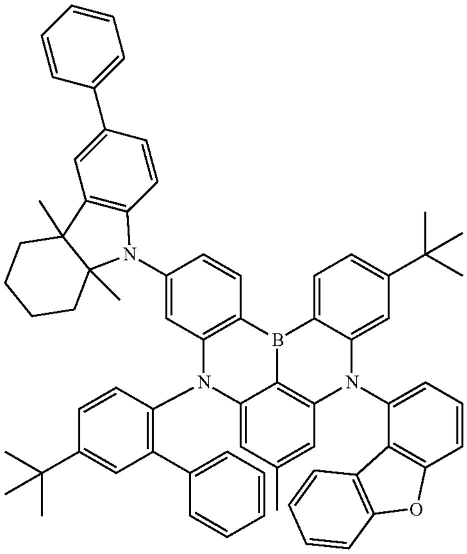
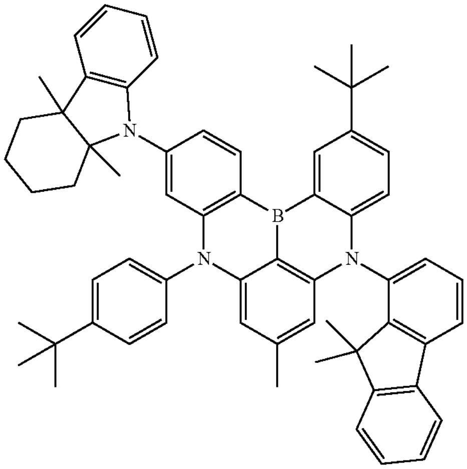
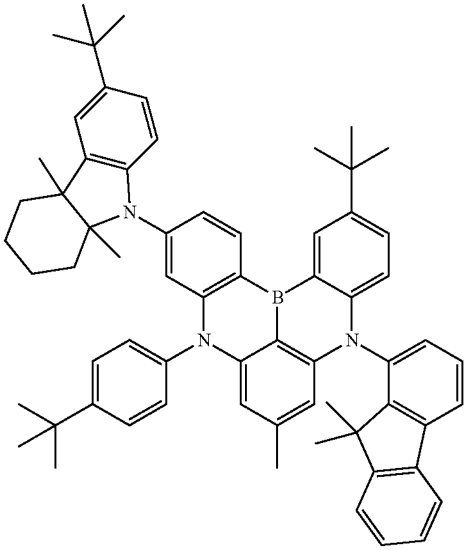
-continued
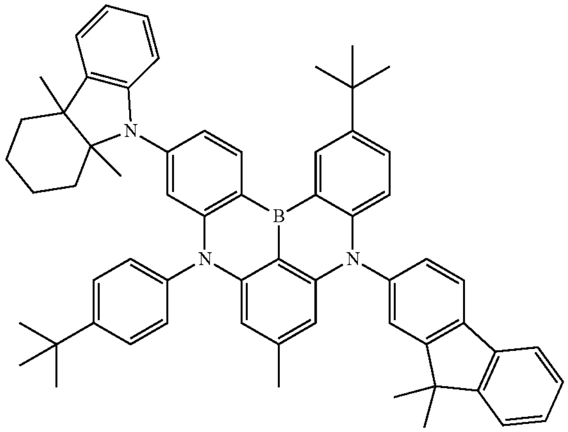
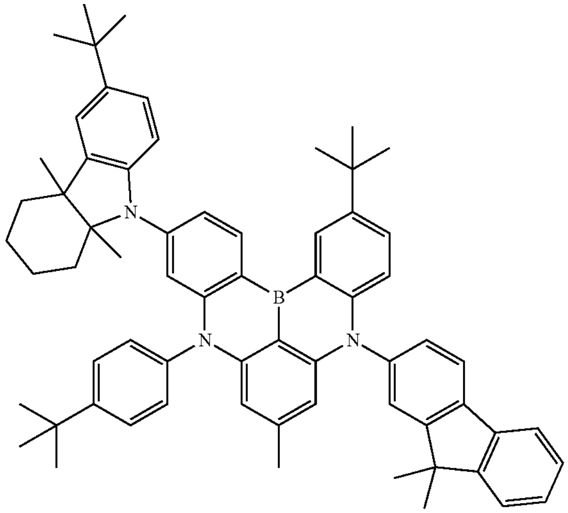
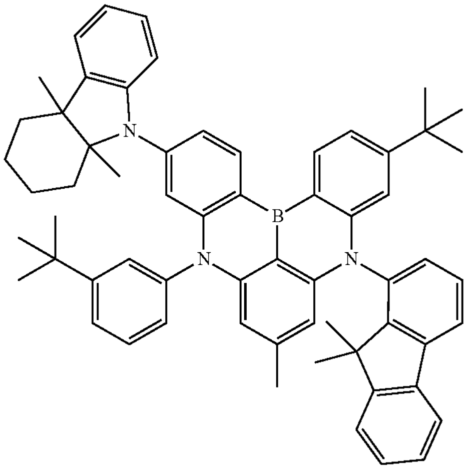

-continued
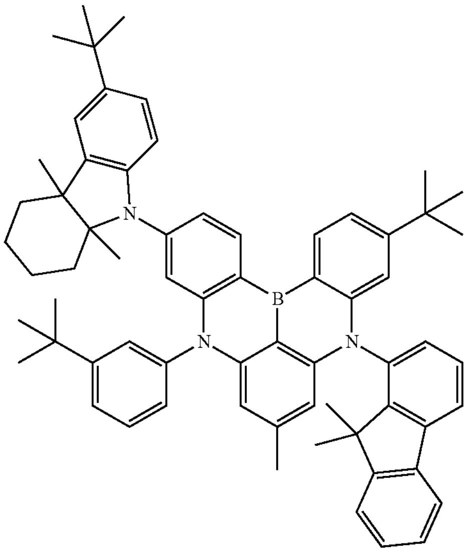
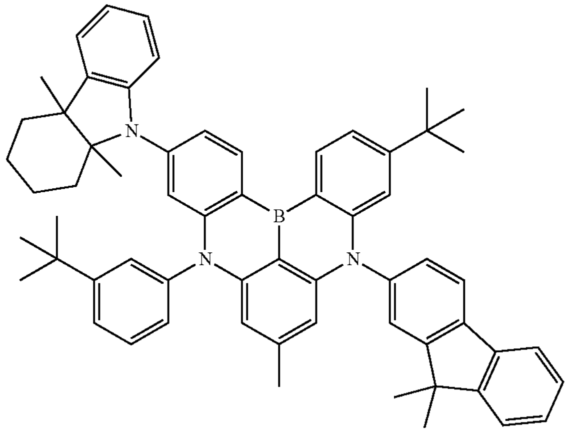
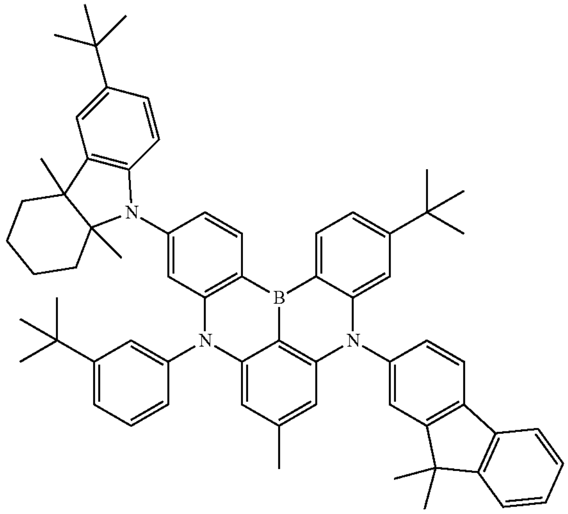
-continued
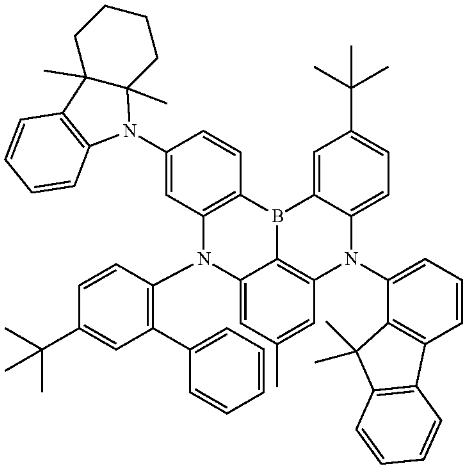
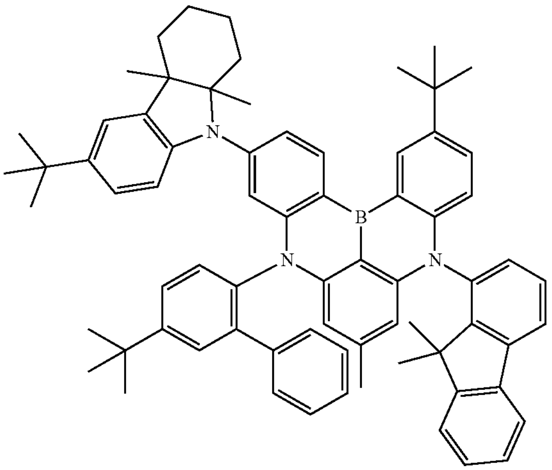
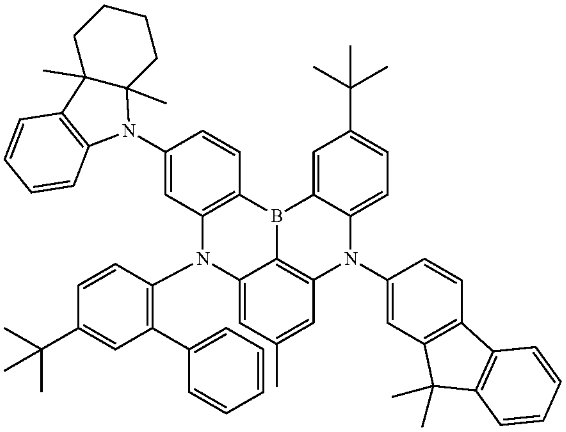

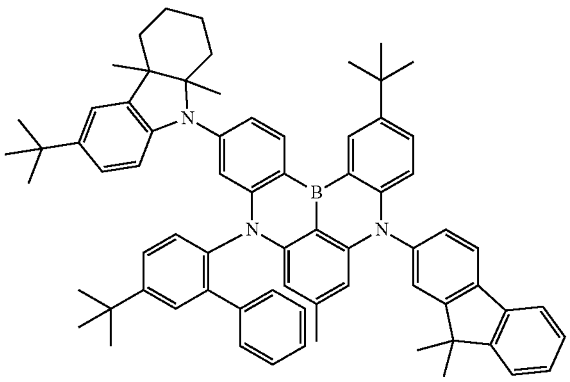
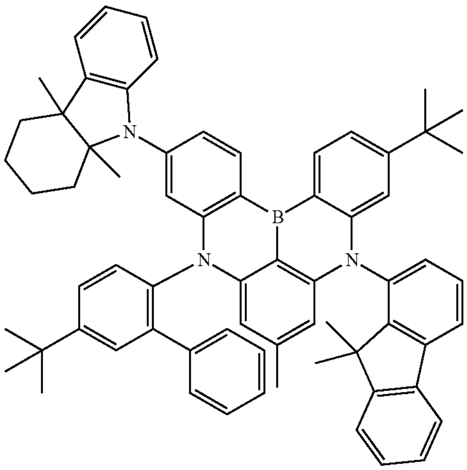
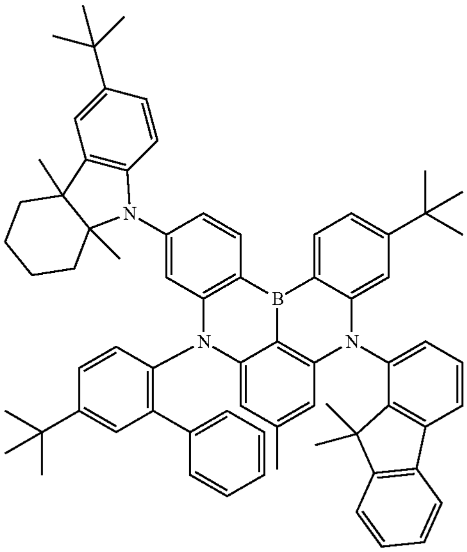
-continued
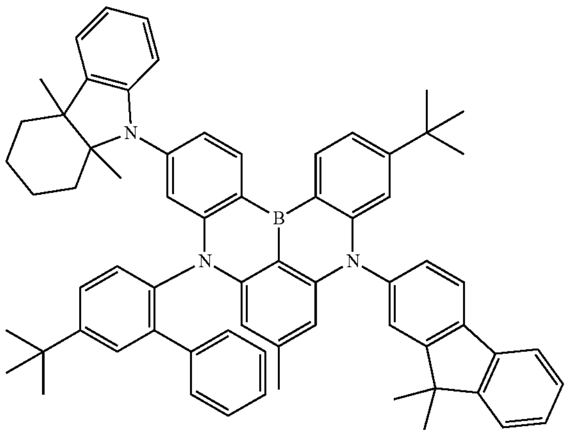
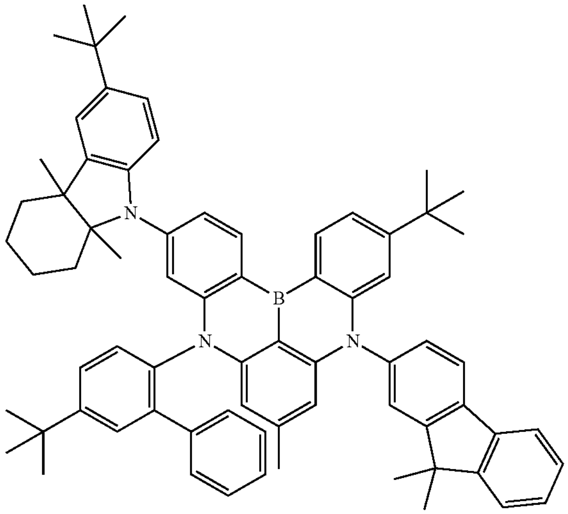
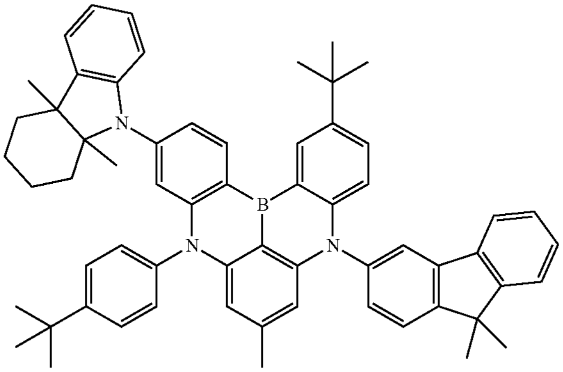

-continued
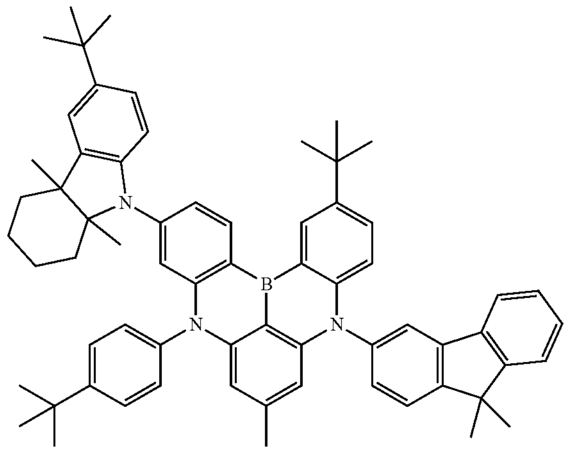
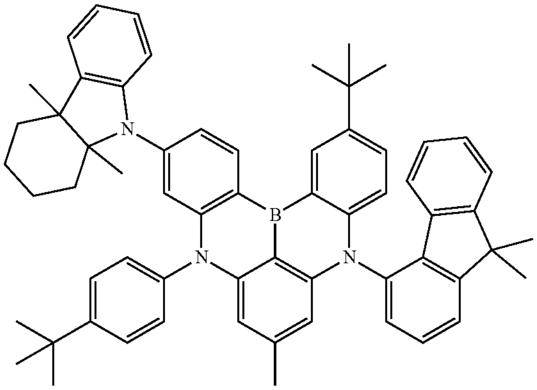
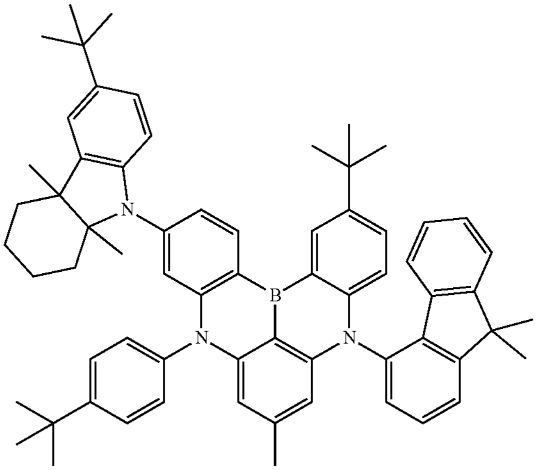
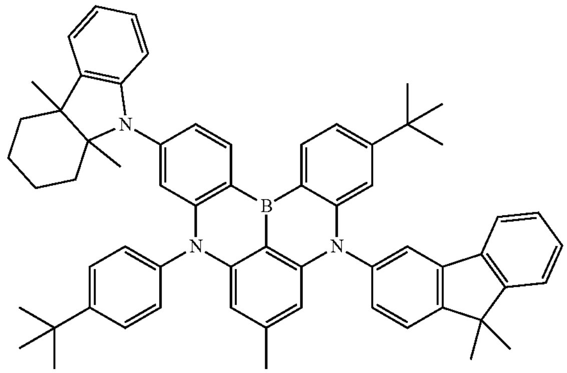
-continued
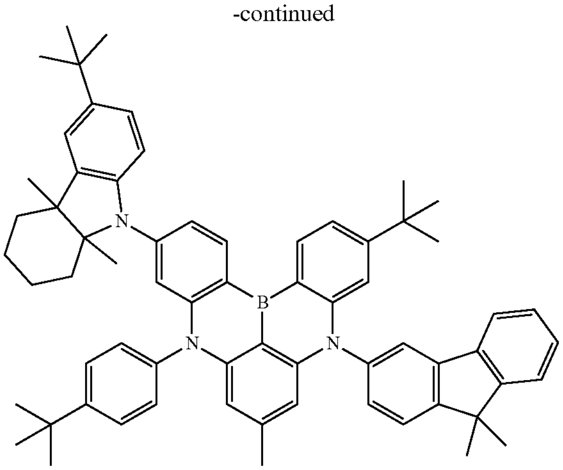
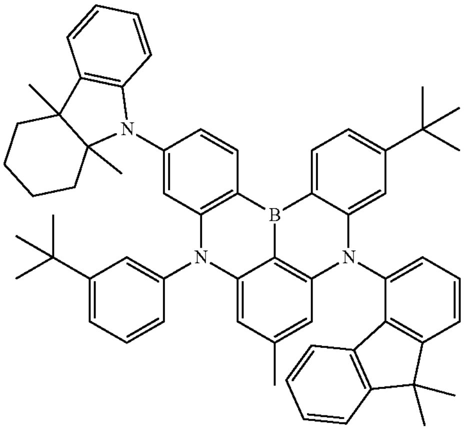
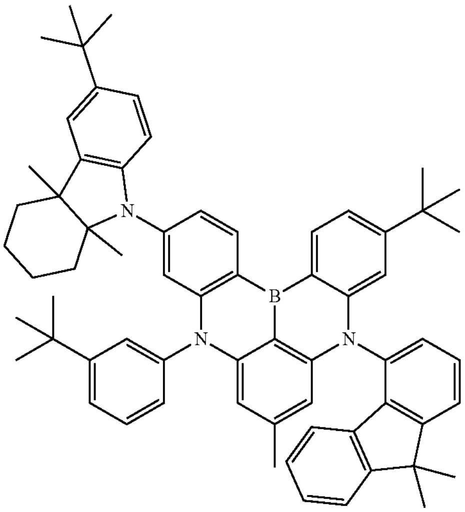

-continued
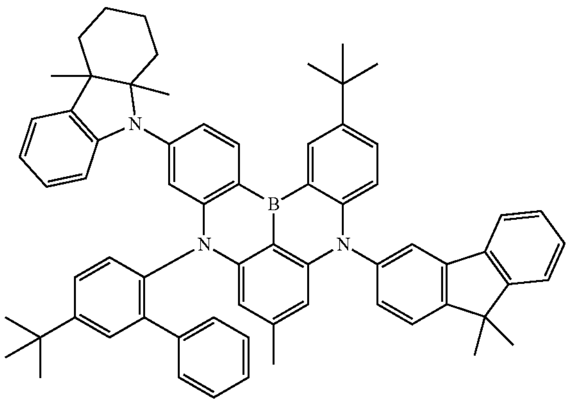
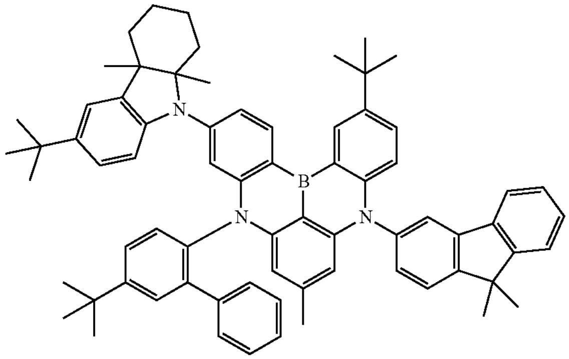
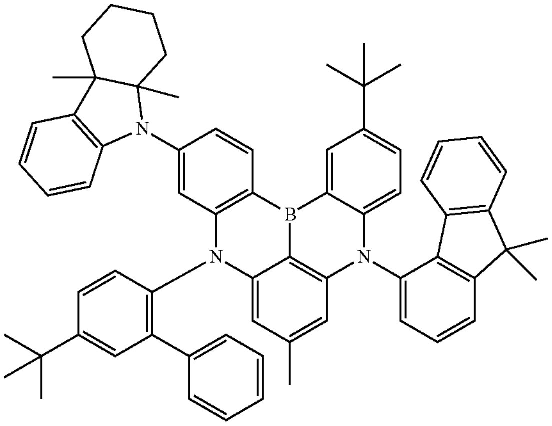
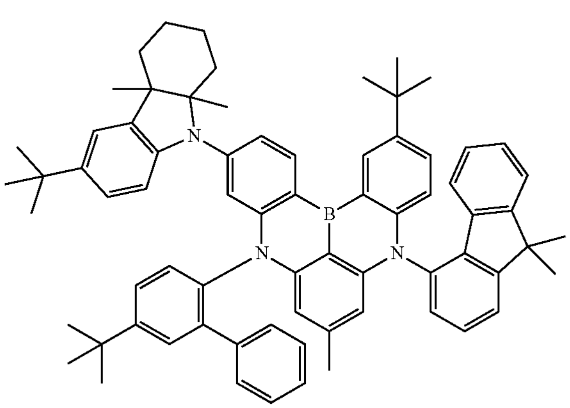
-continued
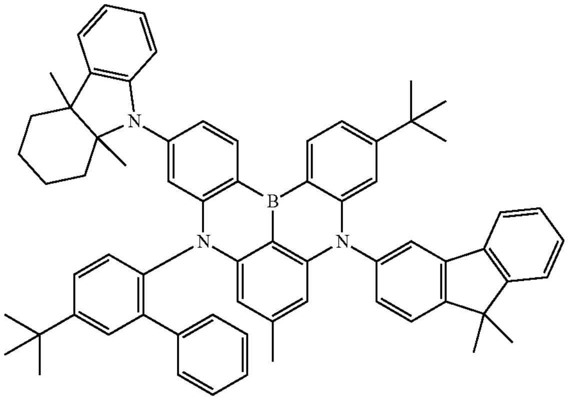
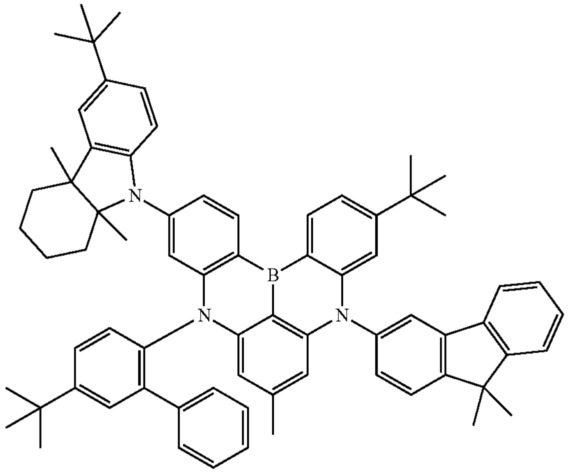
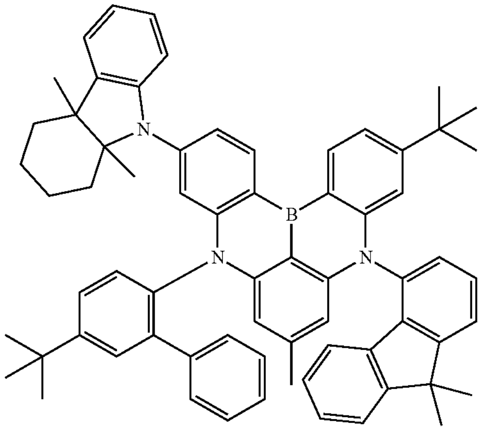

-continued
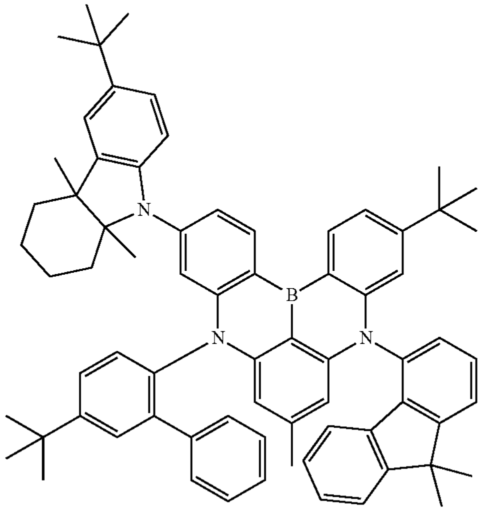
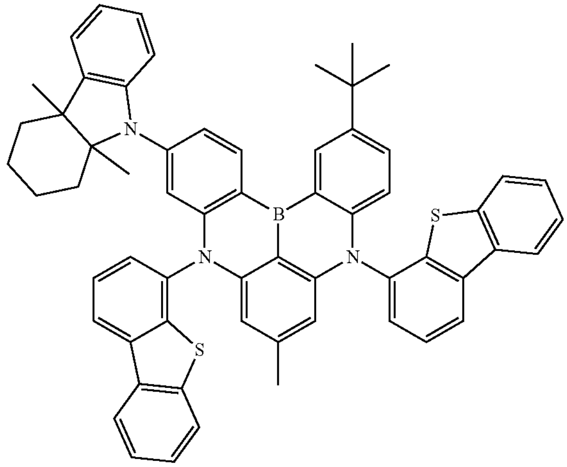
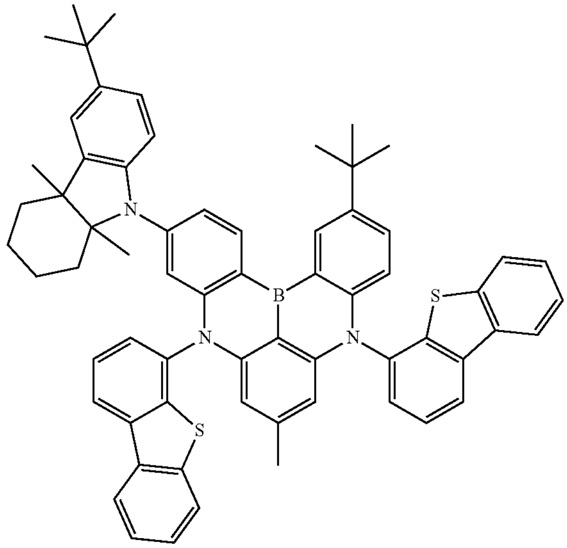
-continued
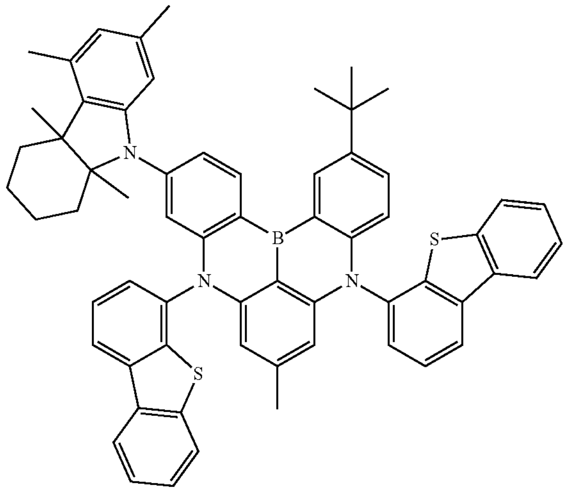
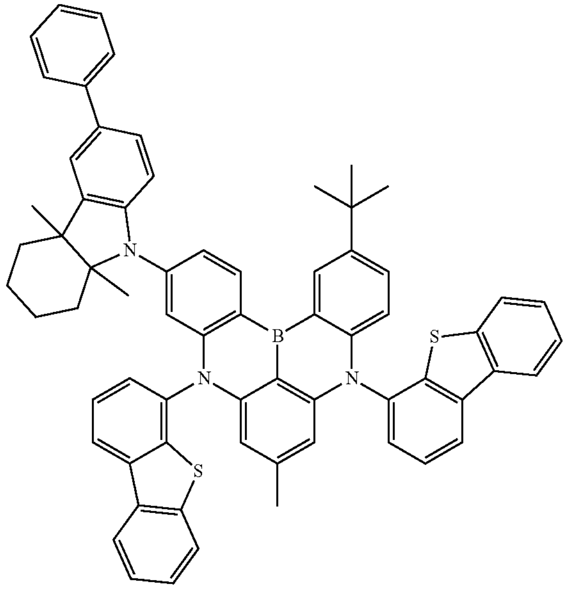
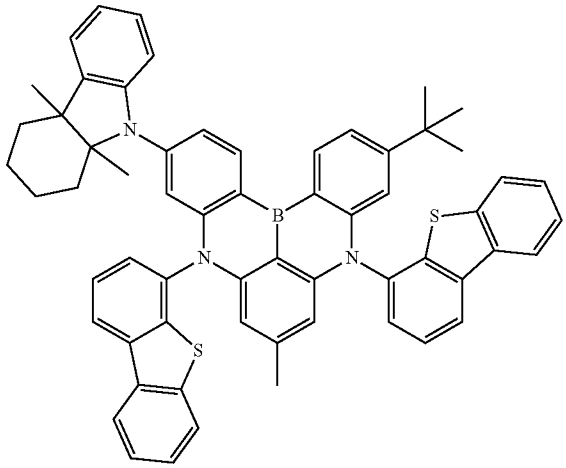

-continued
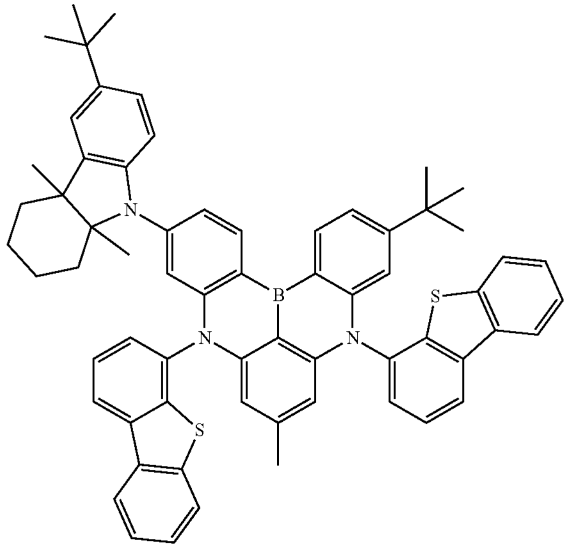
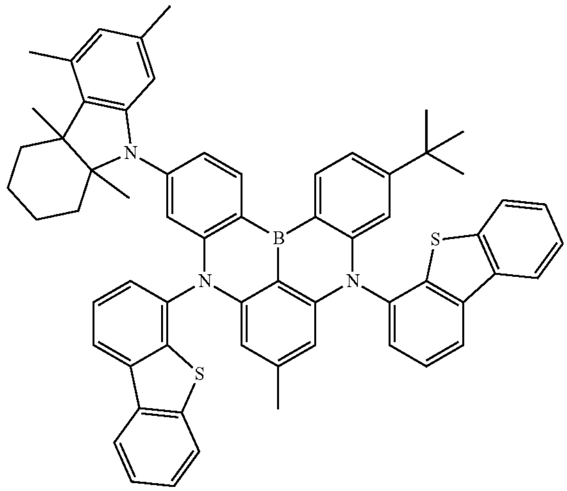
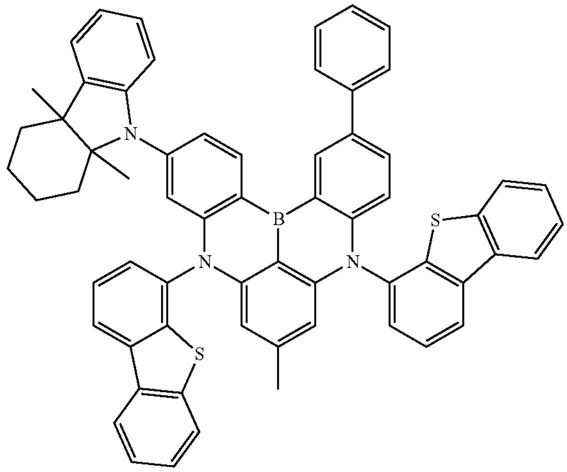
-continued
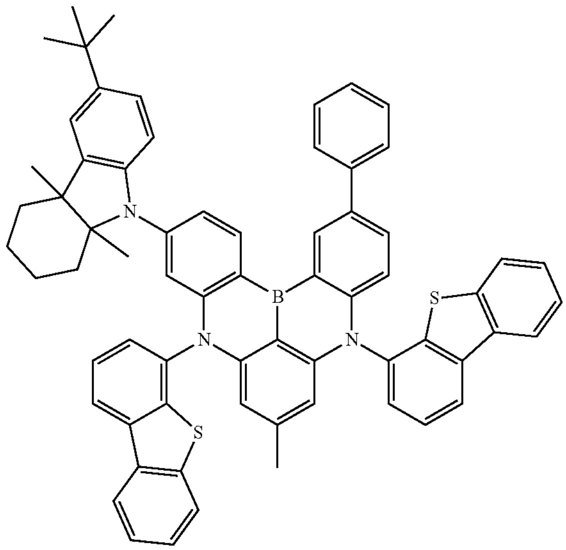
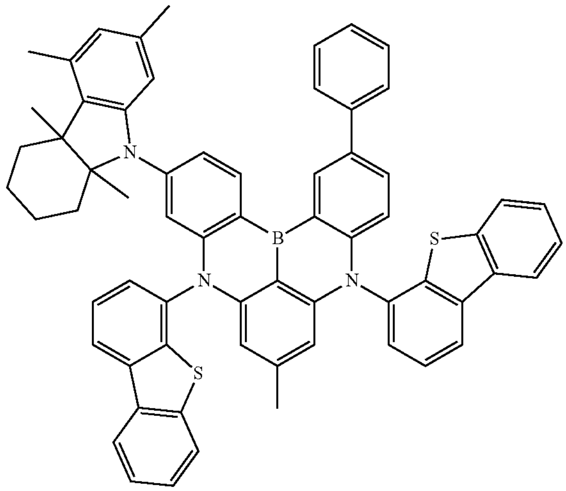
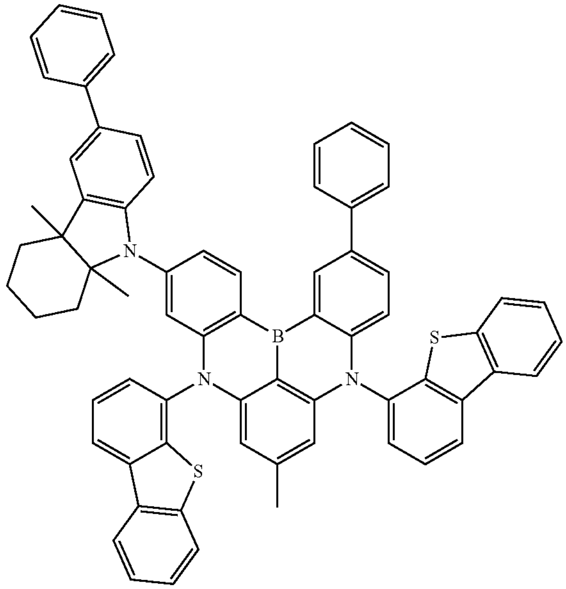

-continued
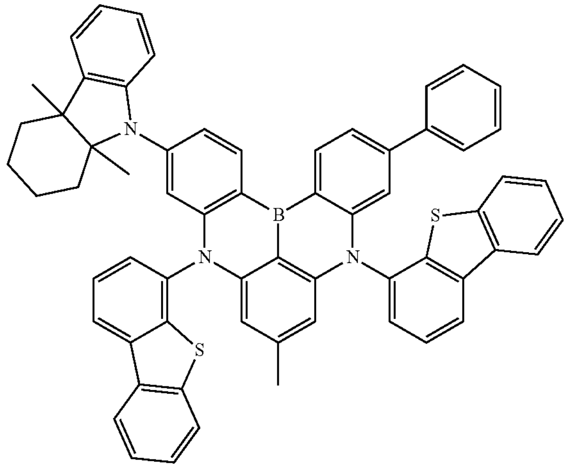
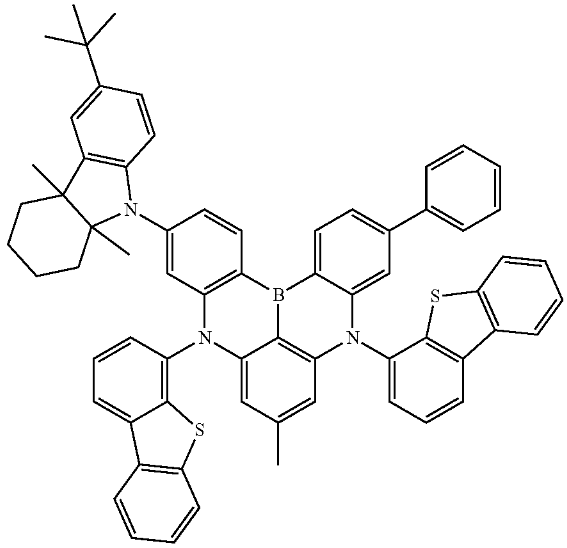
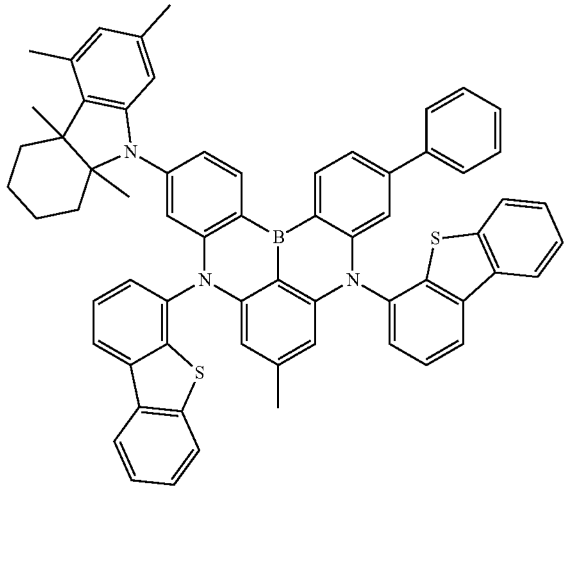
-continued
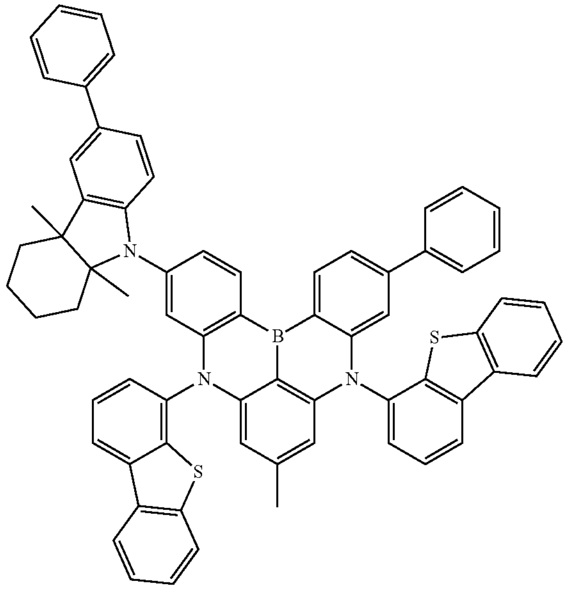 [SMILES: Cc1cc2c3c(c1)N(c1cccc4c1sc1ccccc14)c1cc(N4c5ccc(-c6ccccc6)cc5C5(C)CCCCC45C)ccc1B3c1ccc(-c3ccccc3)cc1N2c1cccc2c1sc1ccccc12]
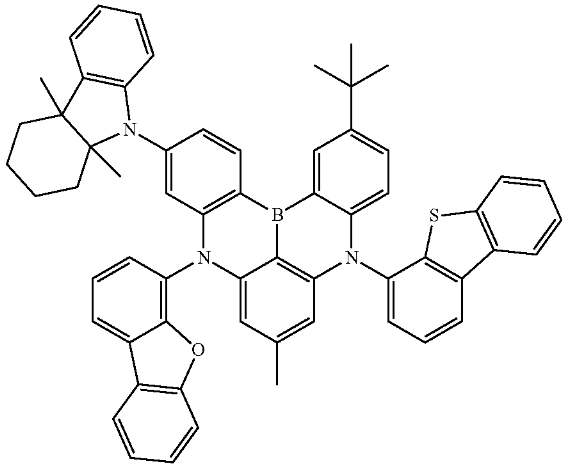
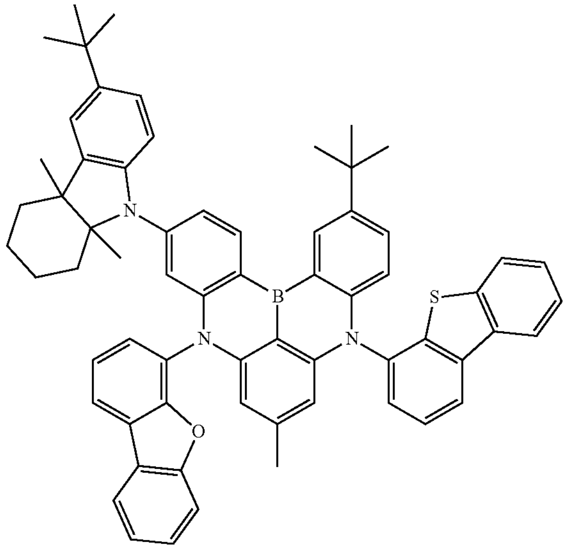

-continued
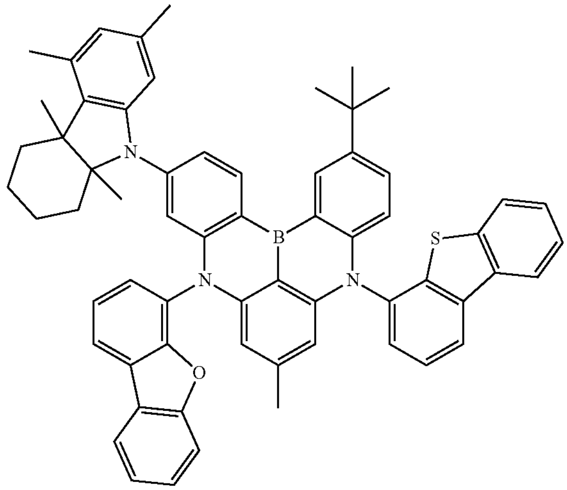
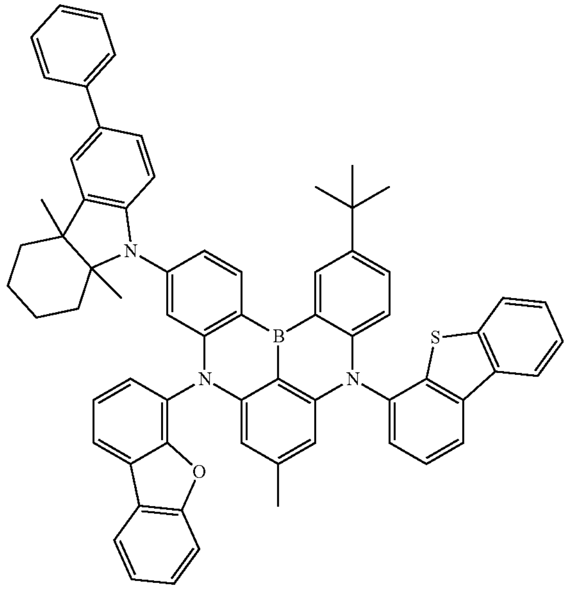
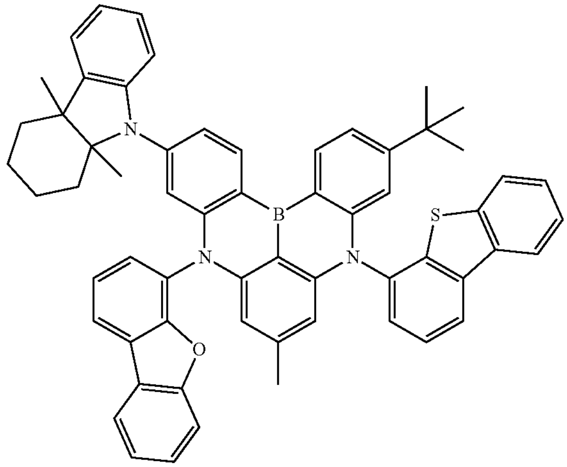
-continued
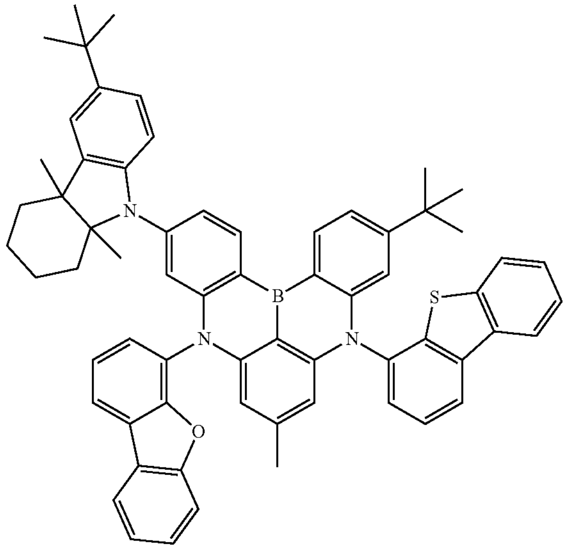
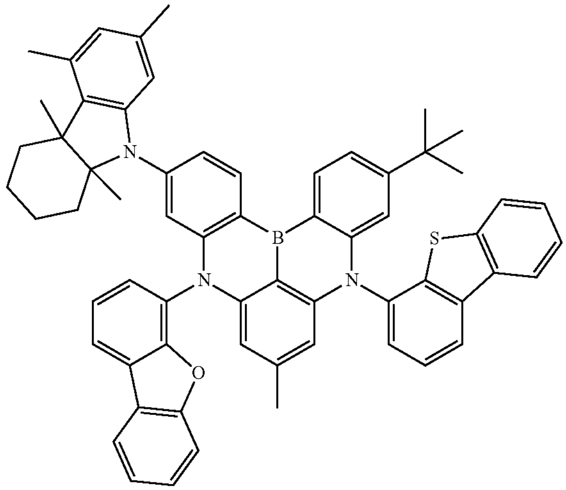
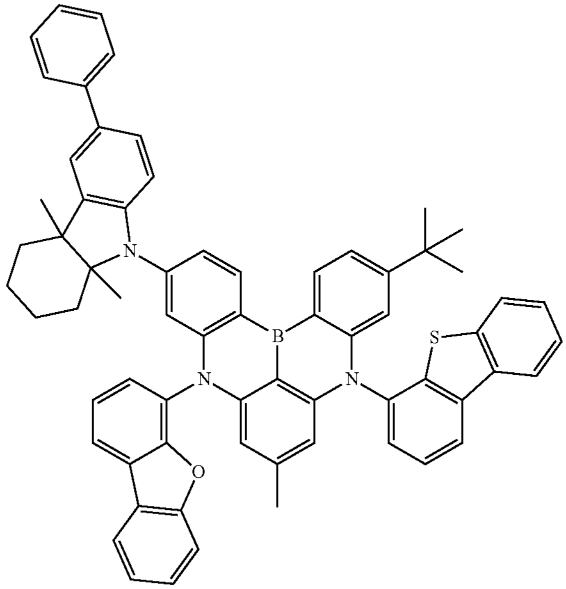

-continued
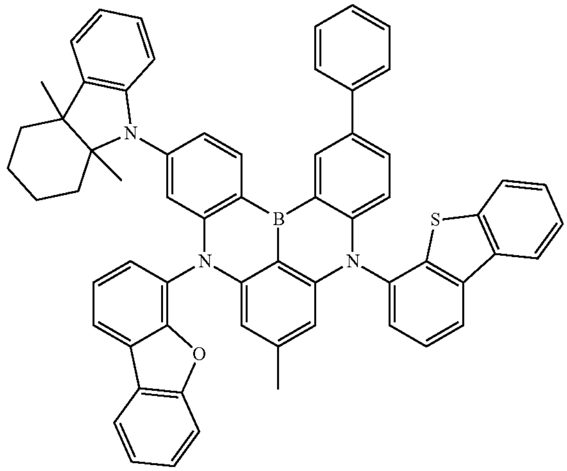
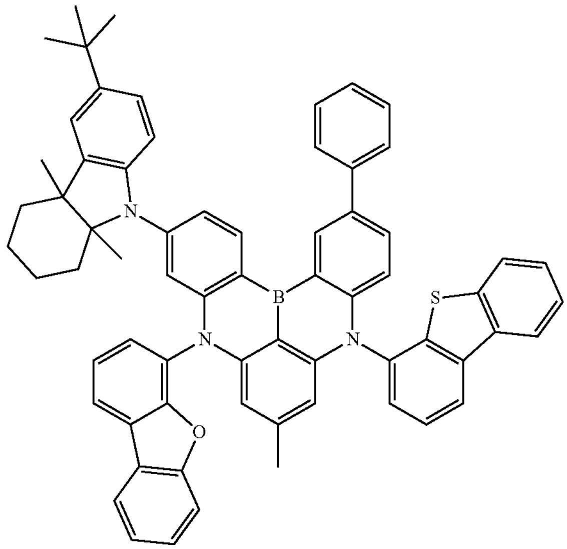
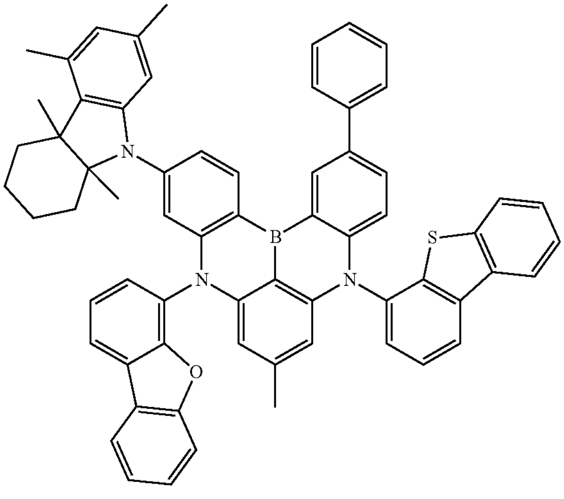
-continued
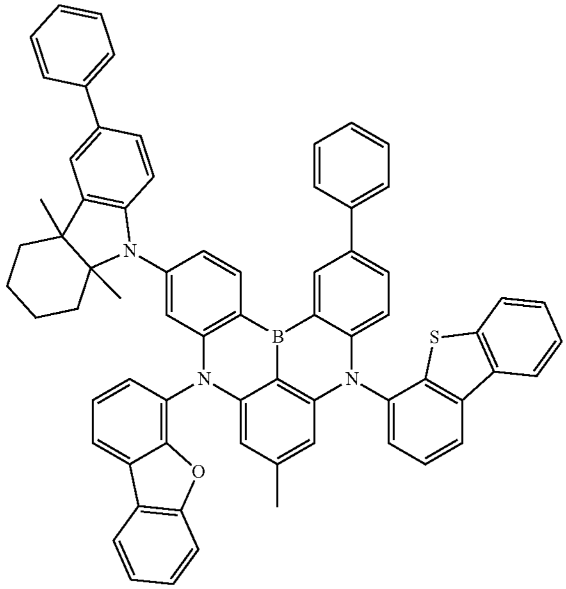
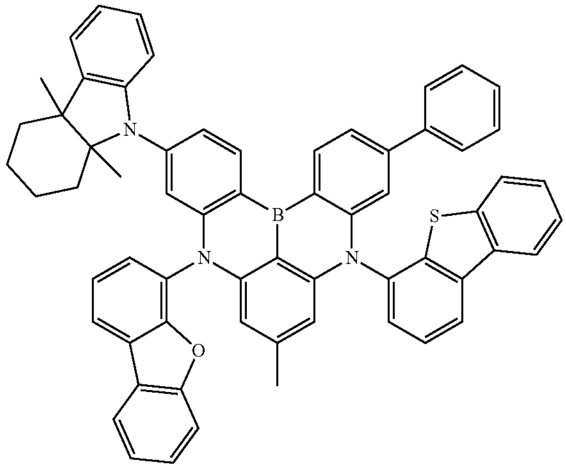
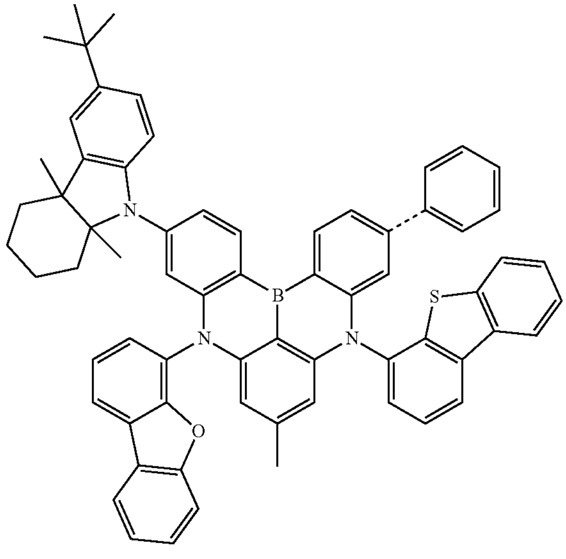

-continued
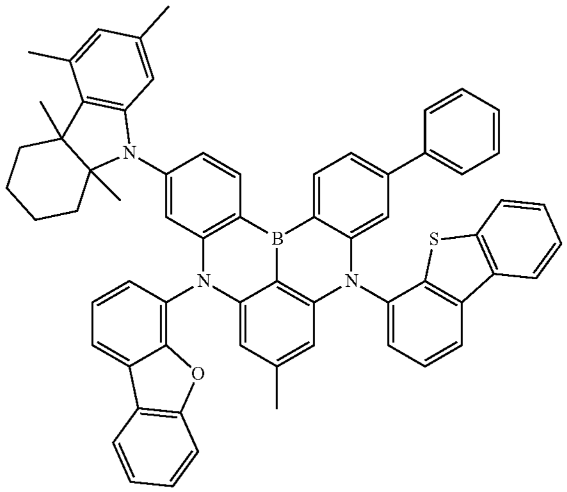
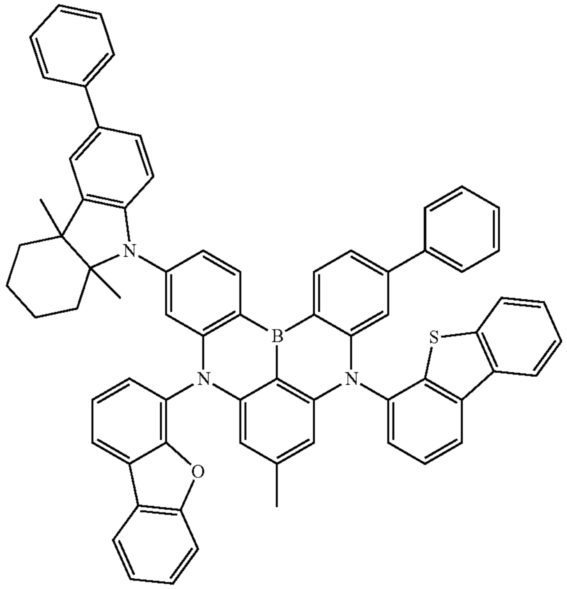
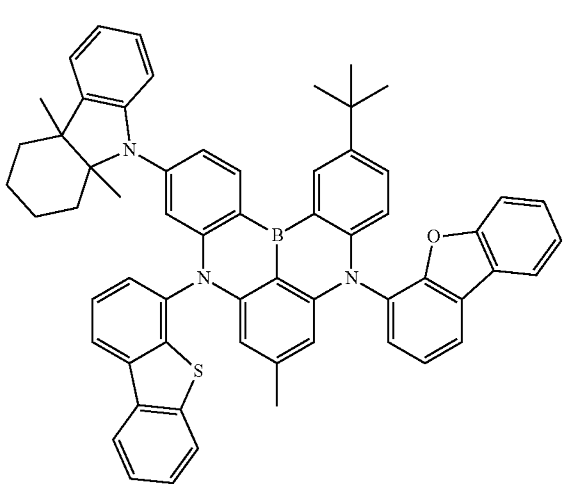
-continued
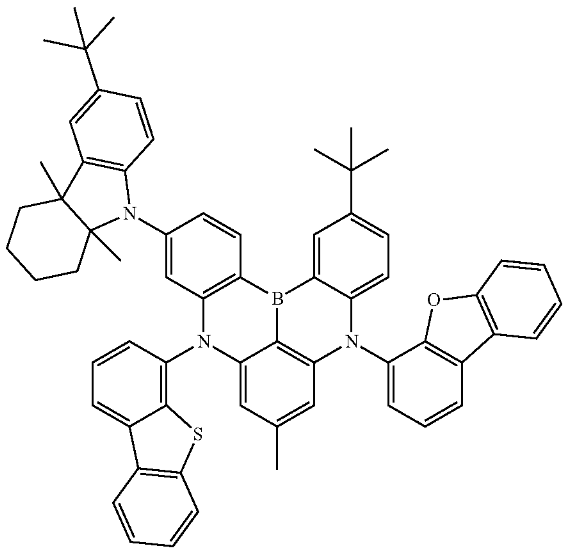
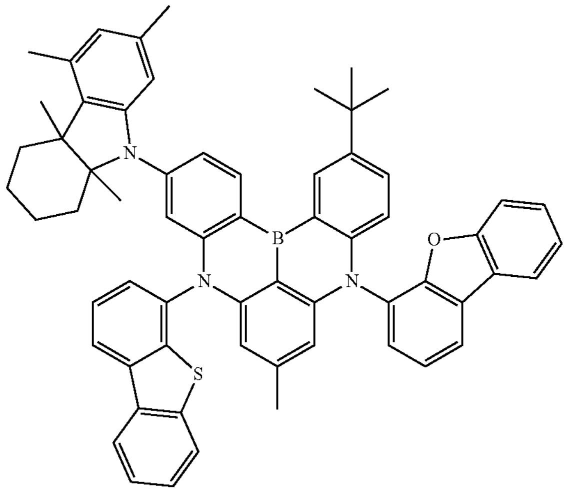
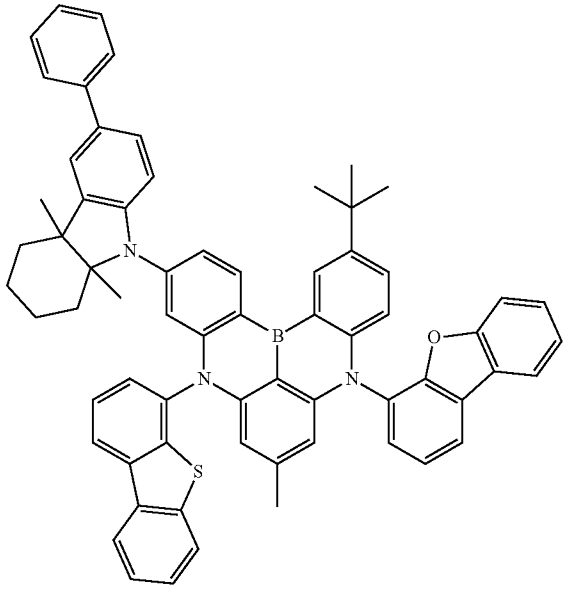

-continued
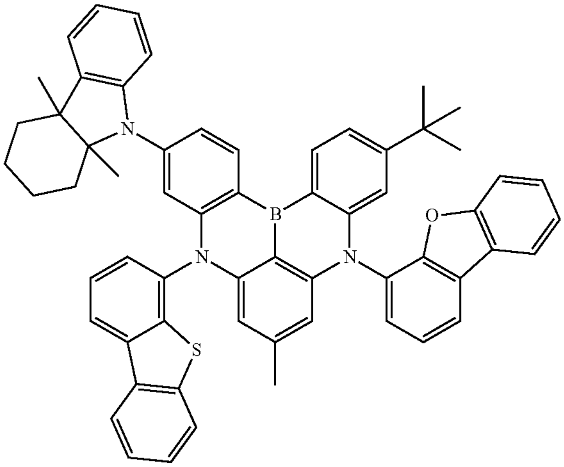
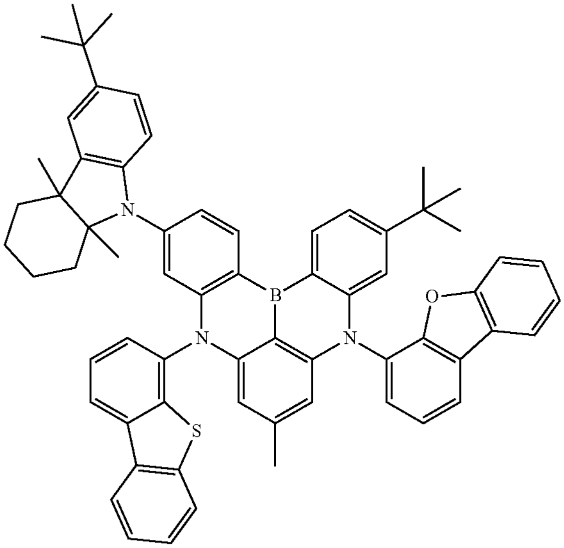
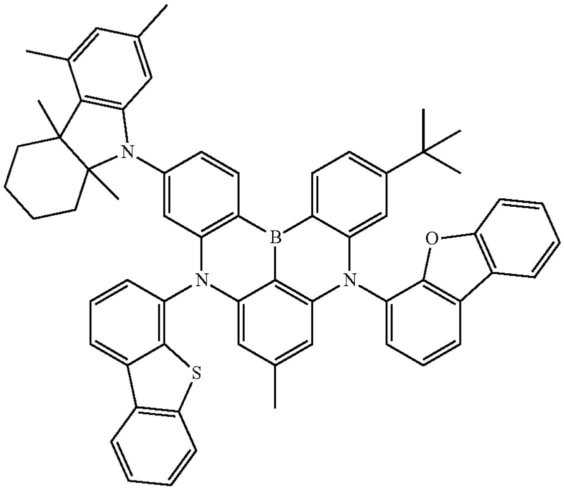
-continued
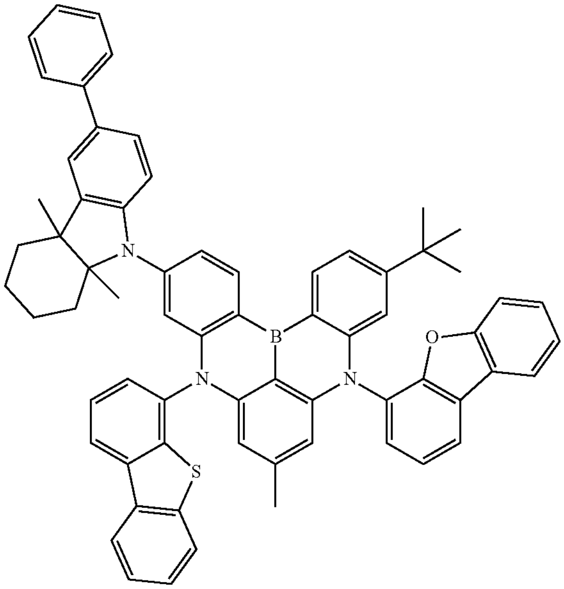
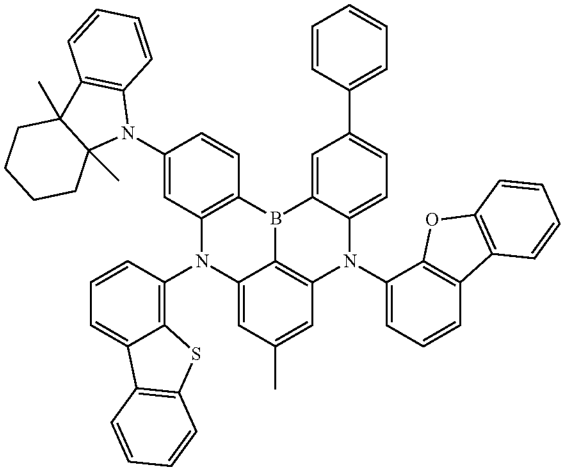
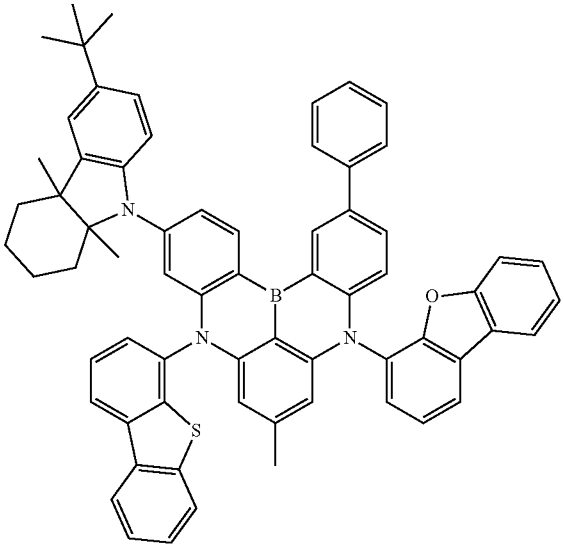

-continued
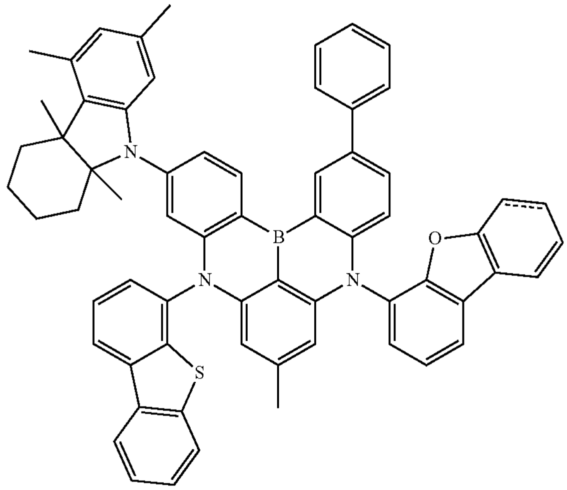
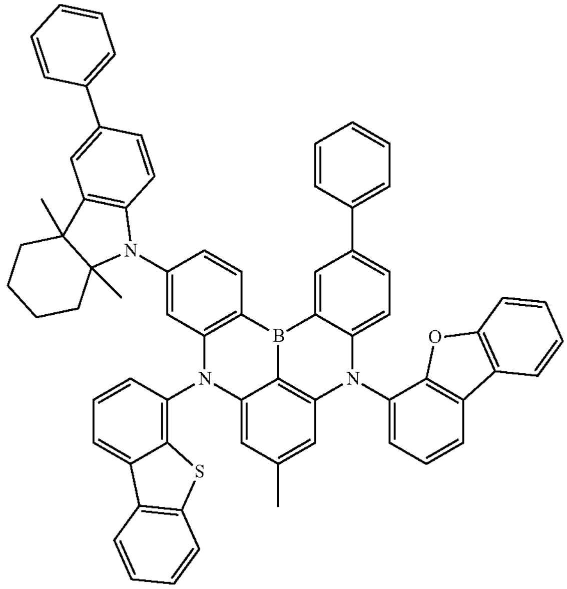
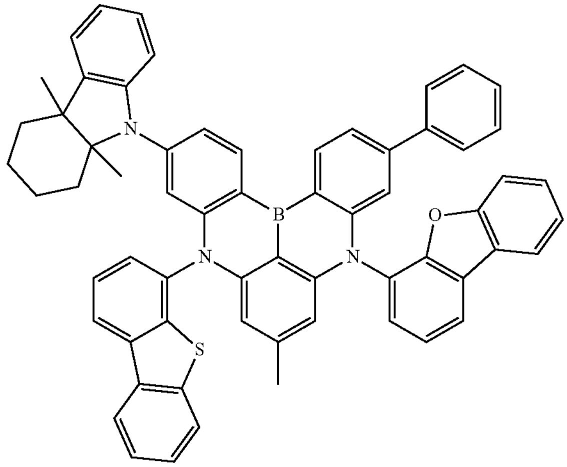
-continued
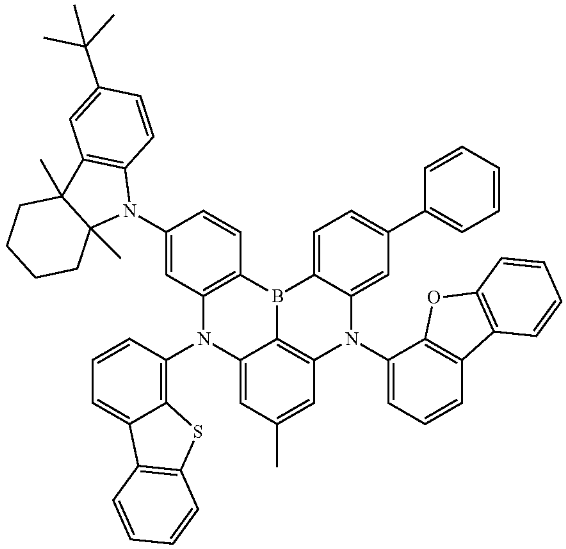
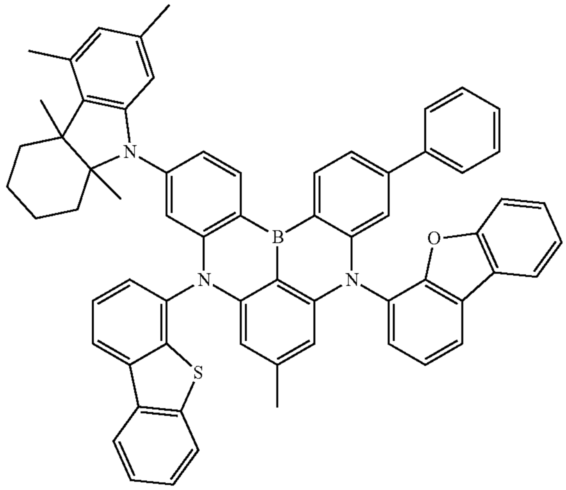
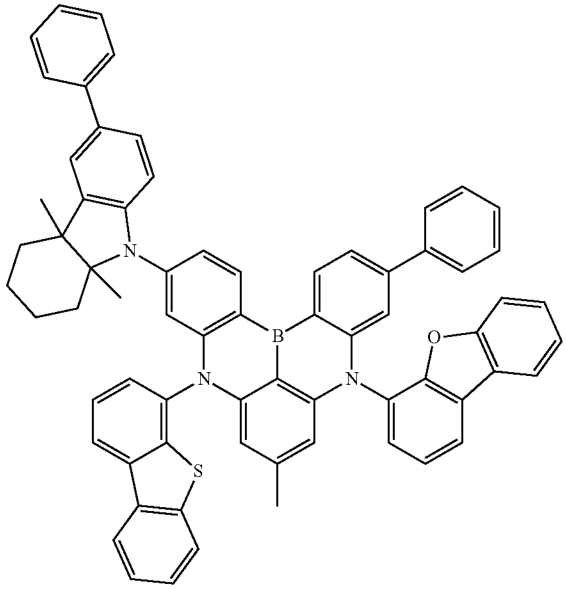

-continued
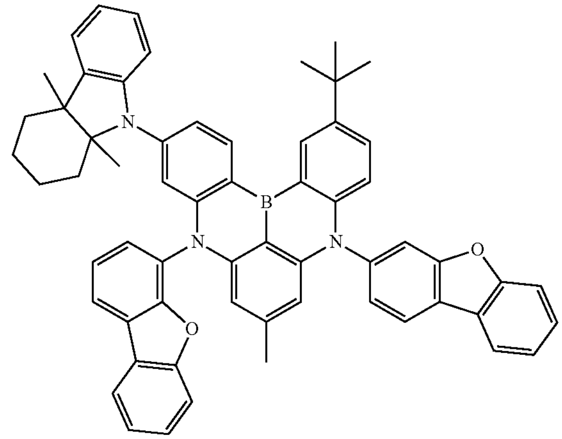
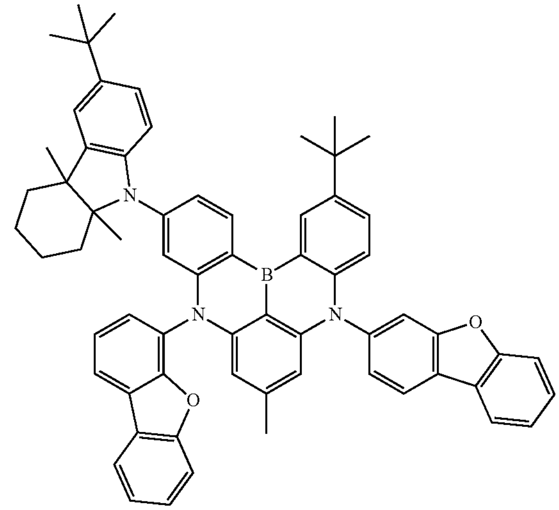
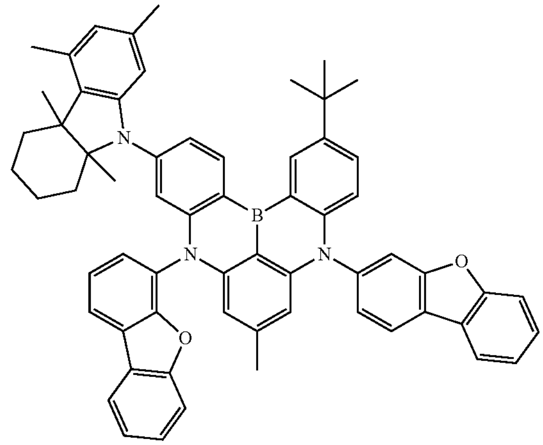
-continued
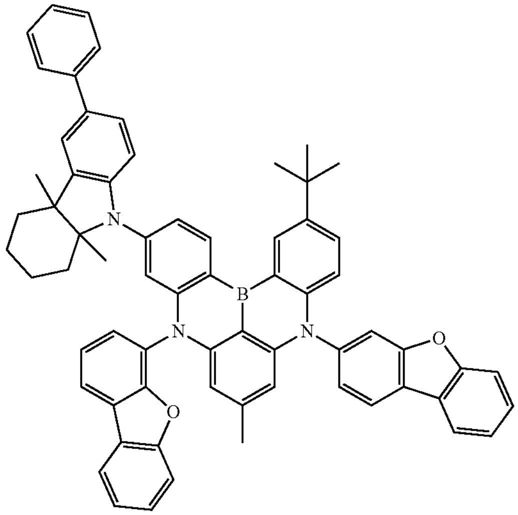
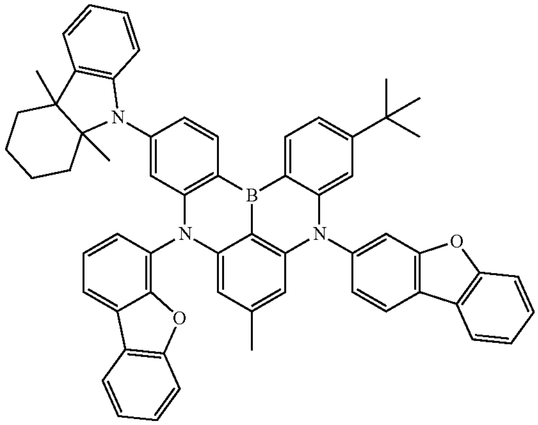
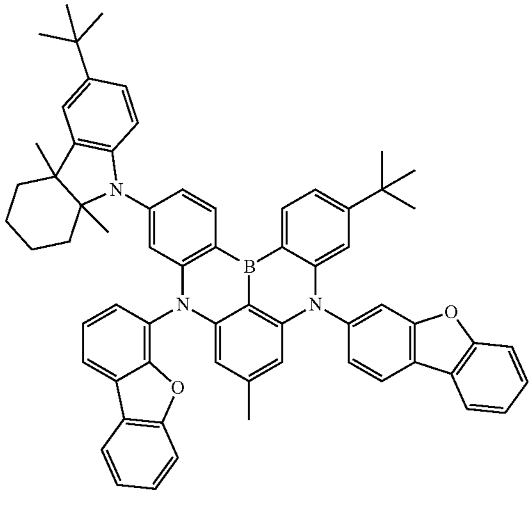

-continued
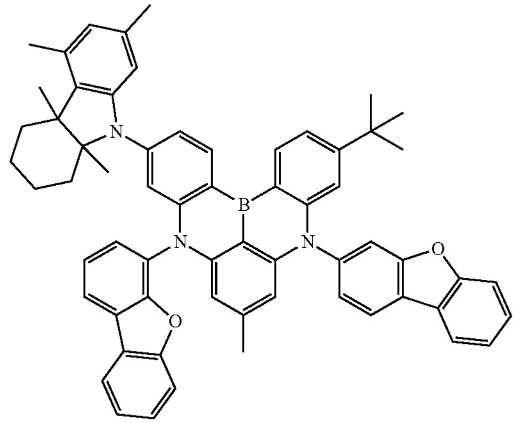
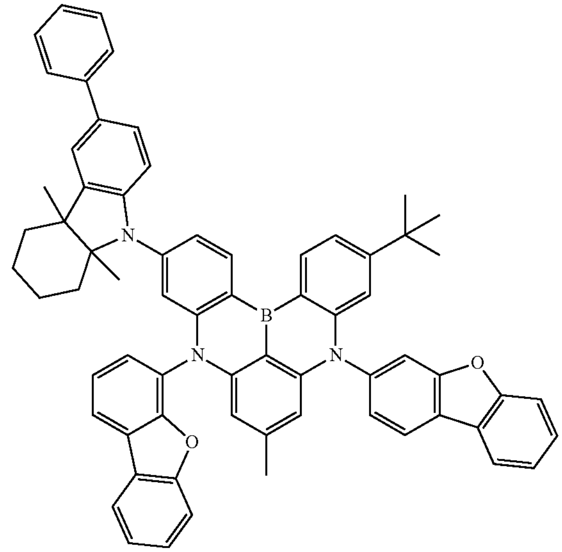
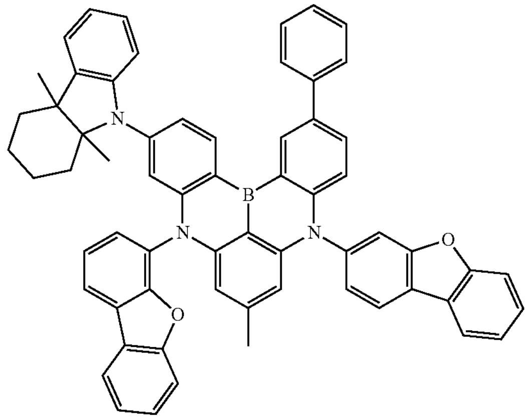
-continued
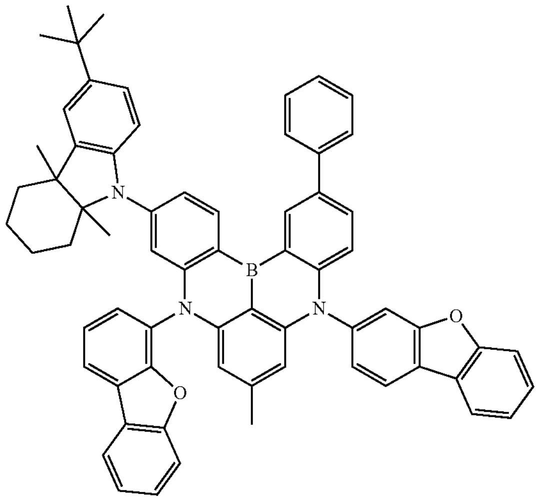
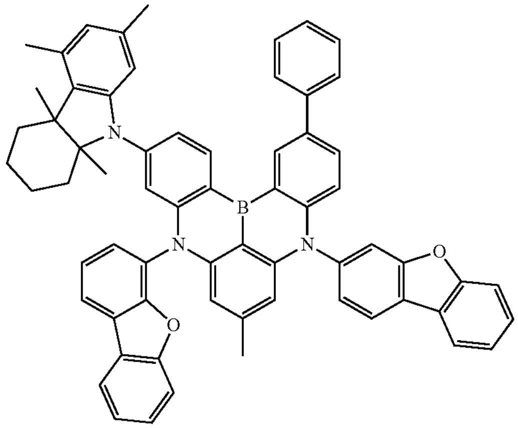
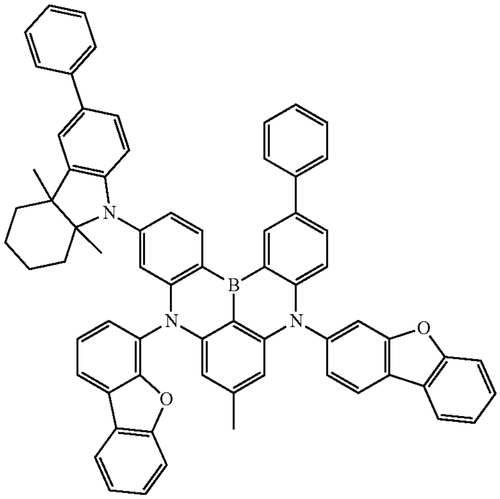

-continued
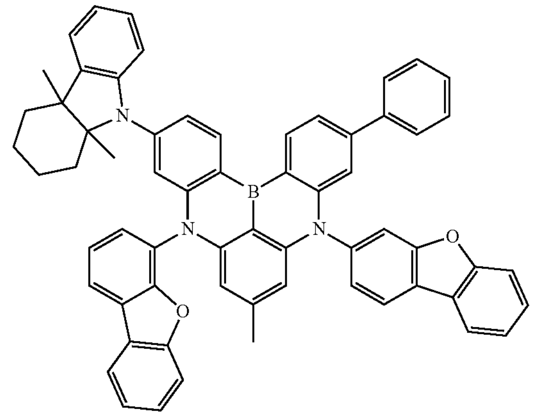
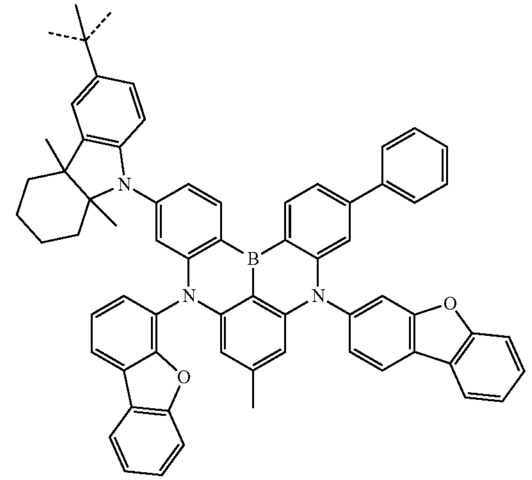
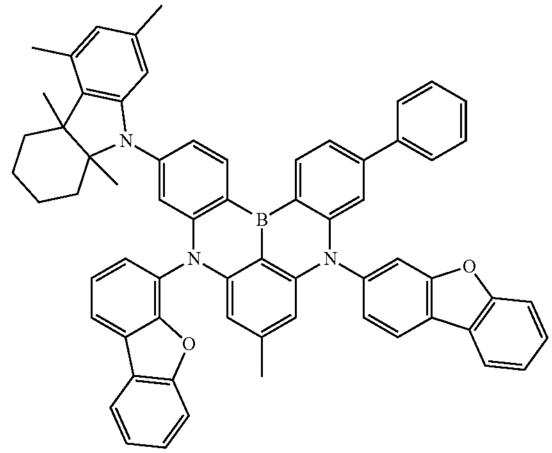
-continued
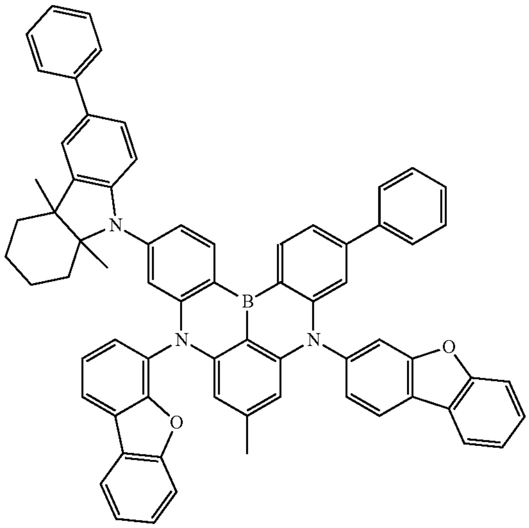
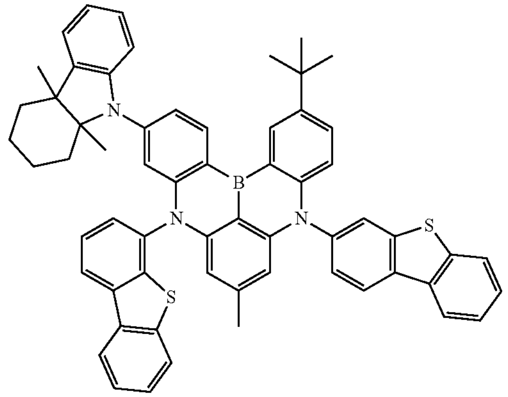
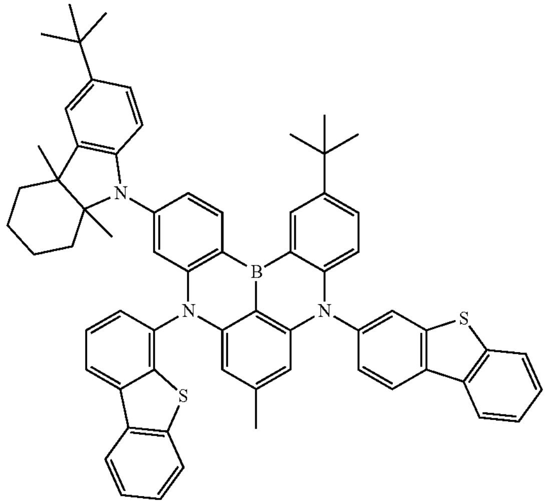

-continued
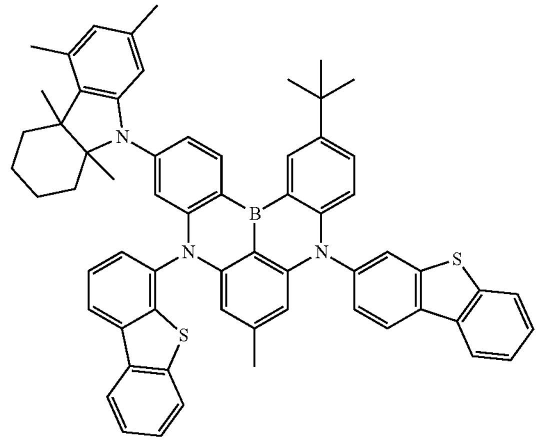
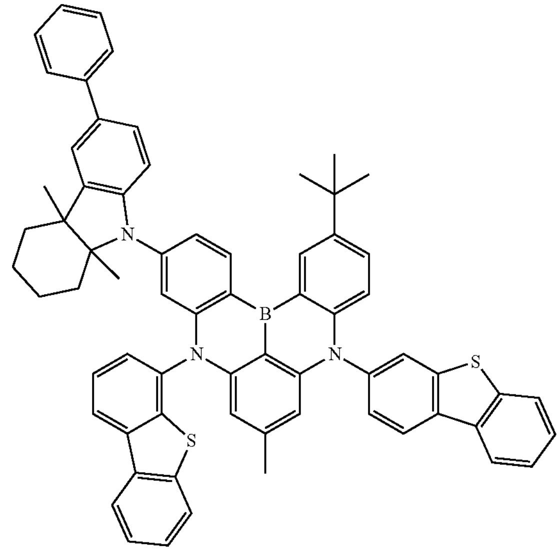
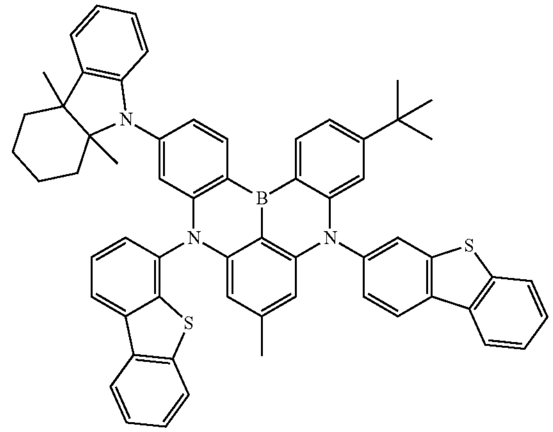
-continued
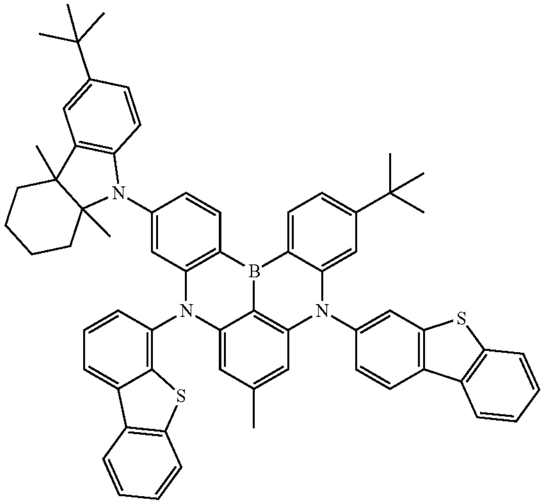
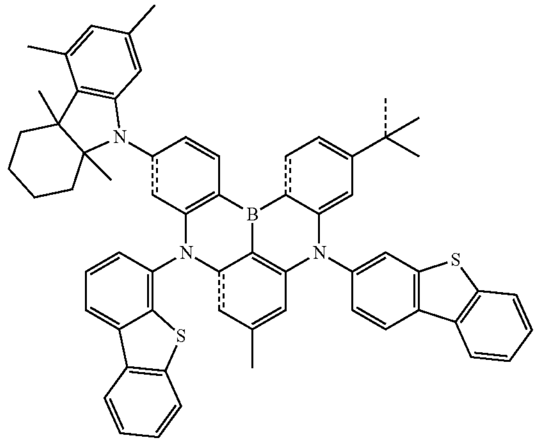
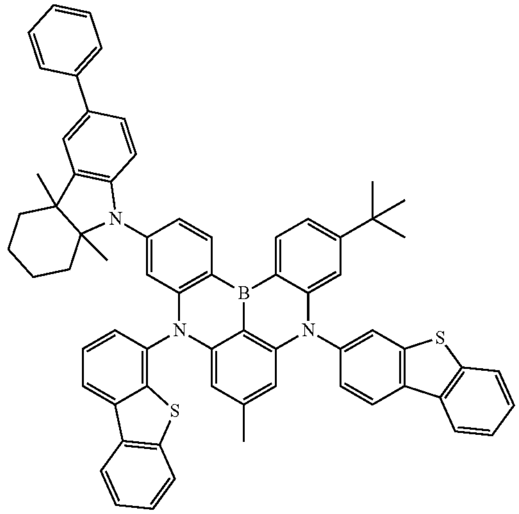

-continued
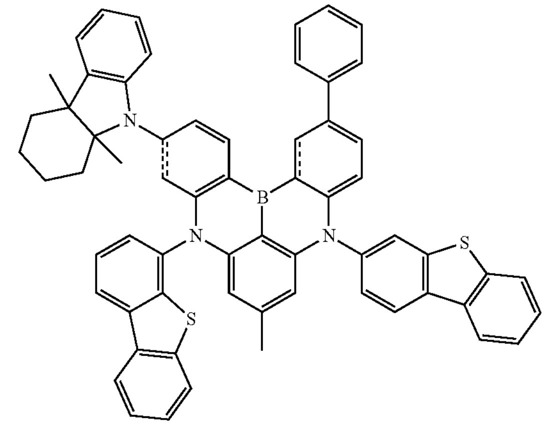
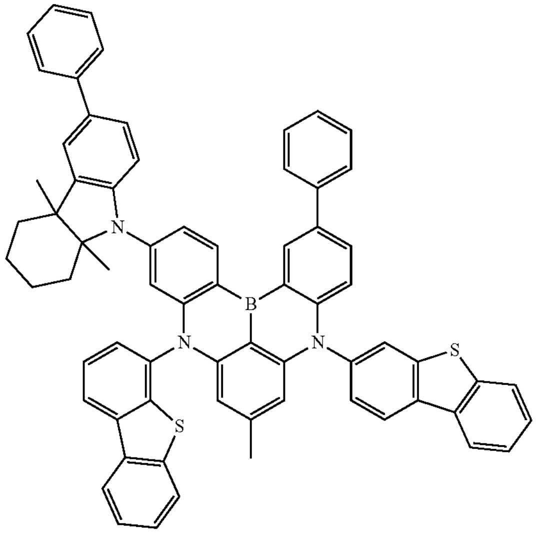
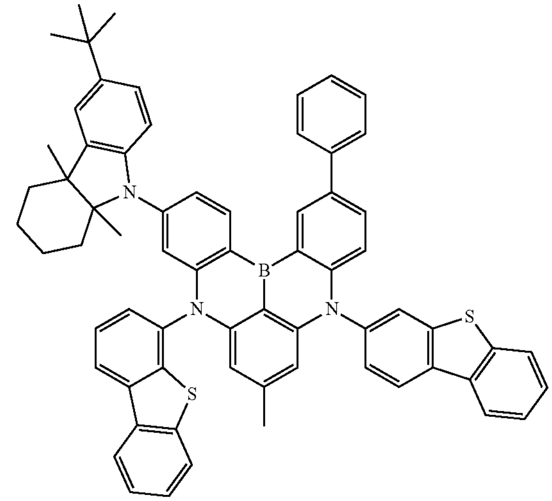
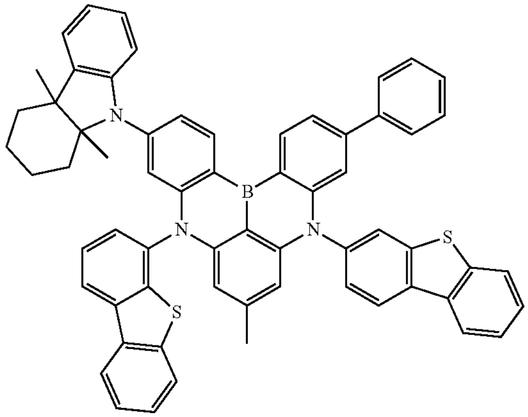
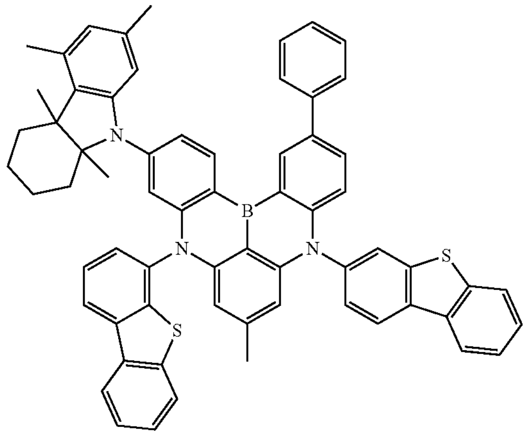
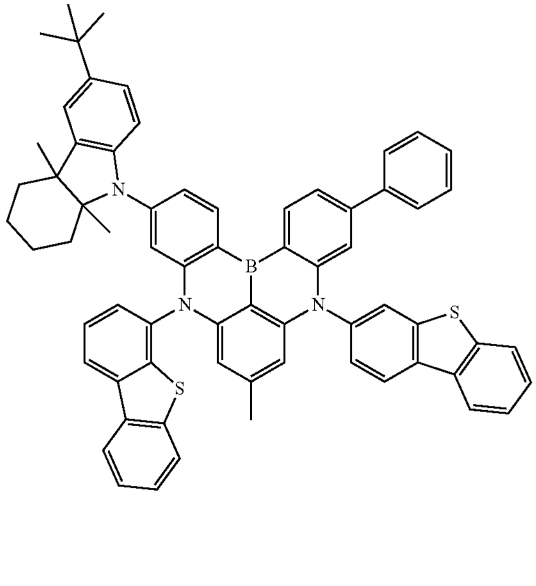
-continued -continued
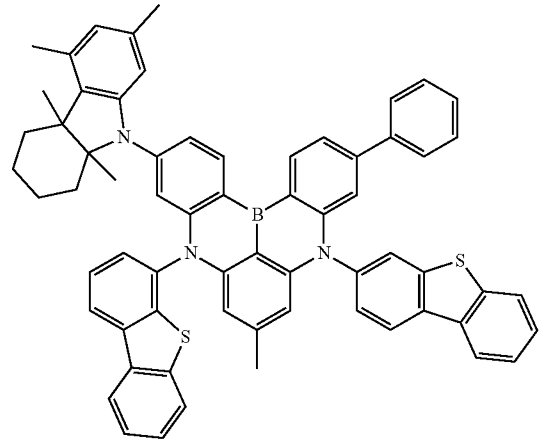
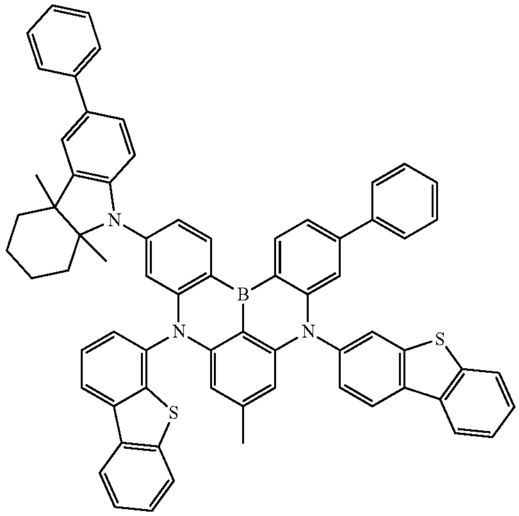
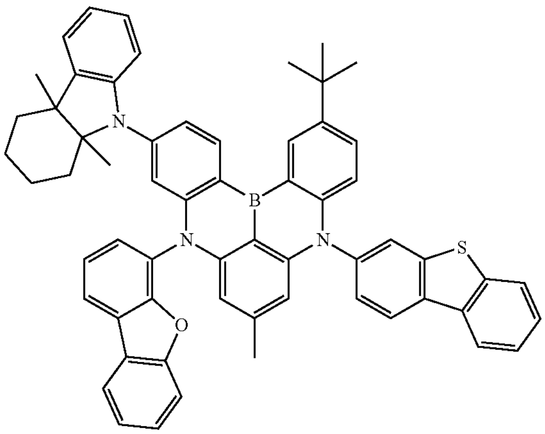
-continued
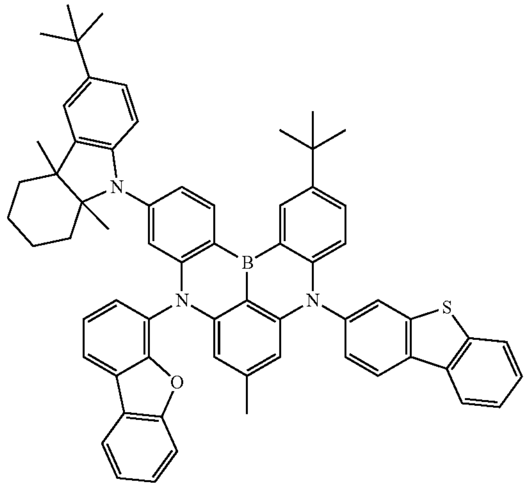
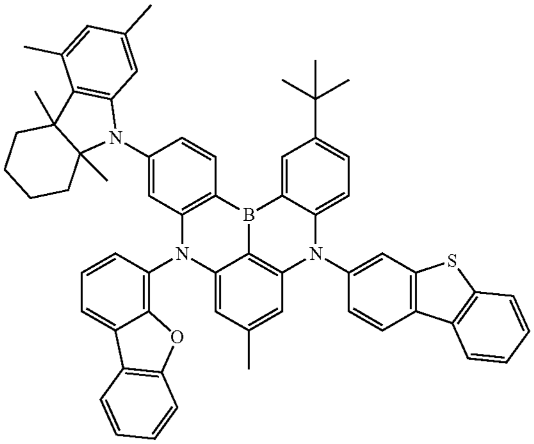
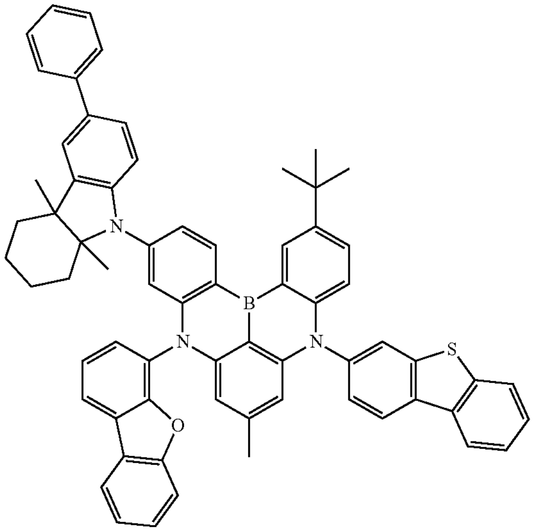

-continued
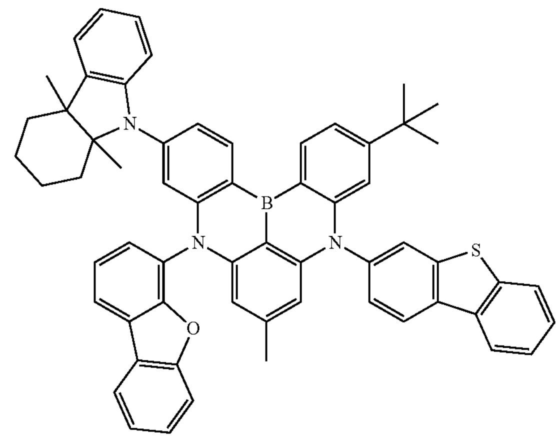
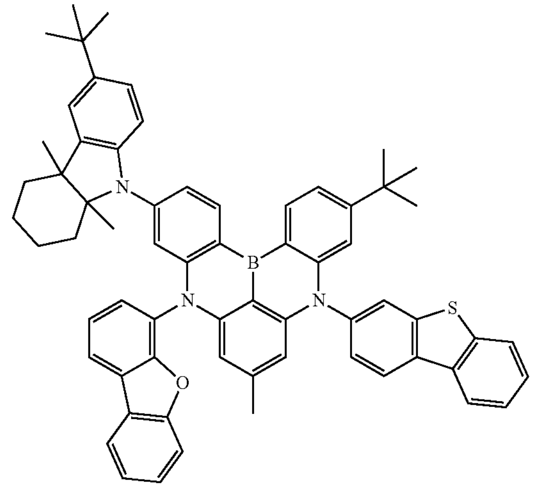
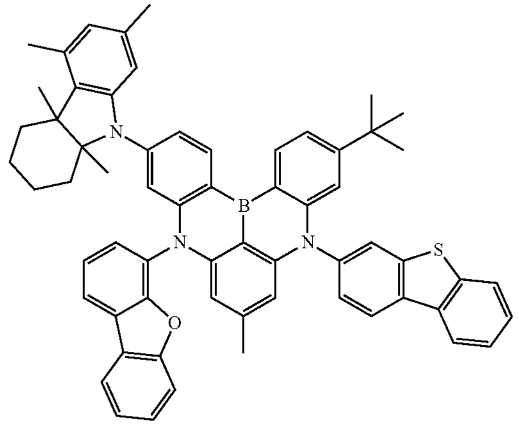
-continued
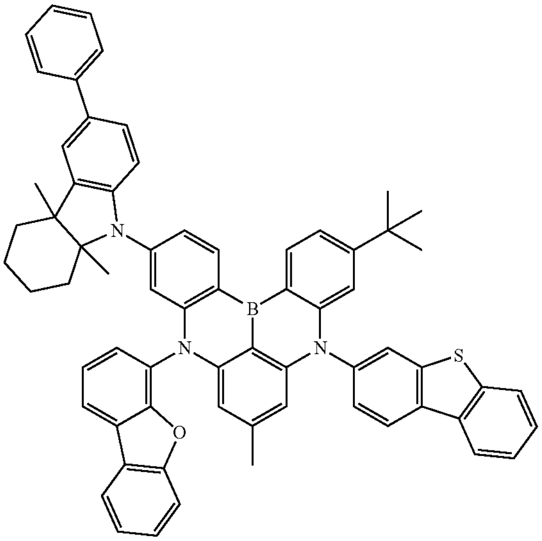
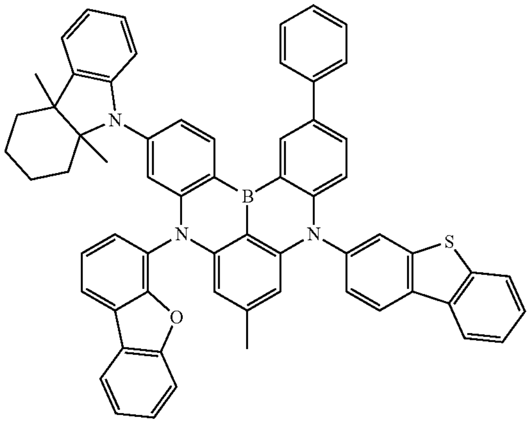
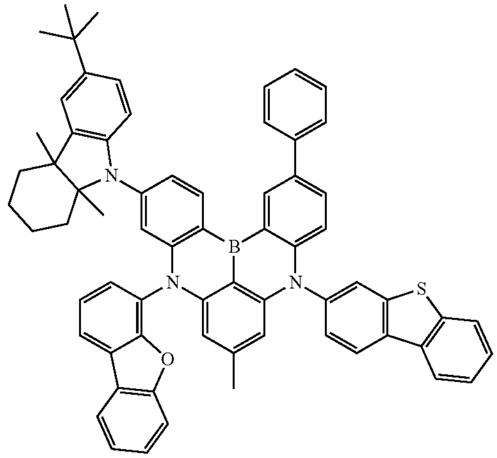

-continued
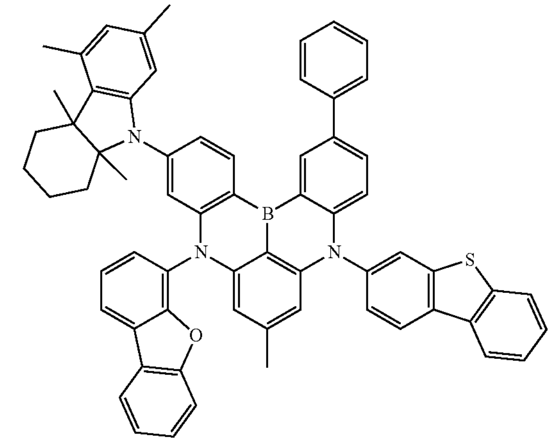
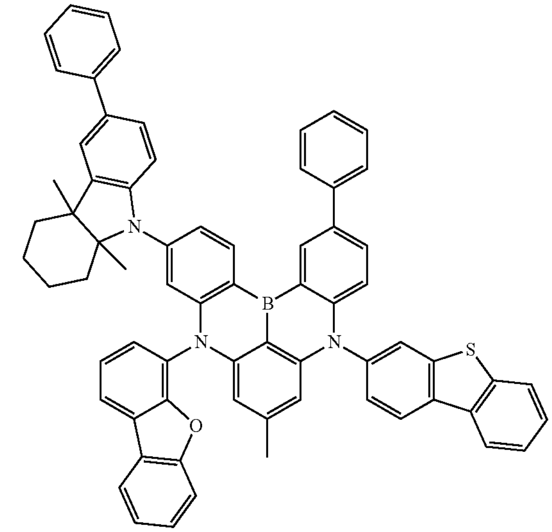
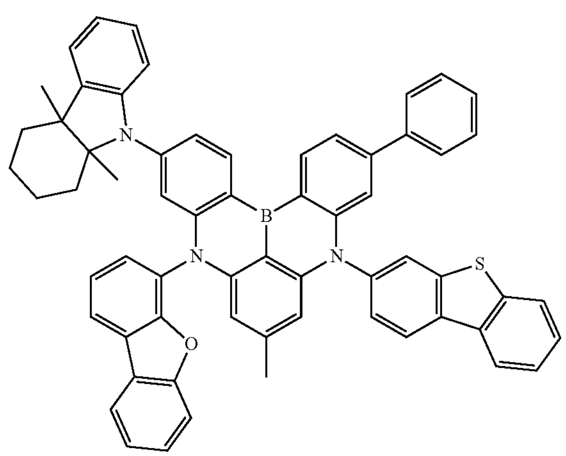
-continued
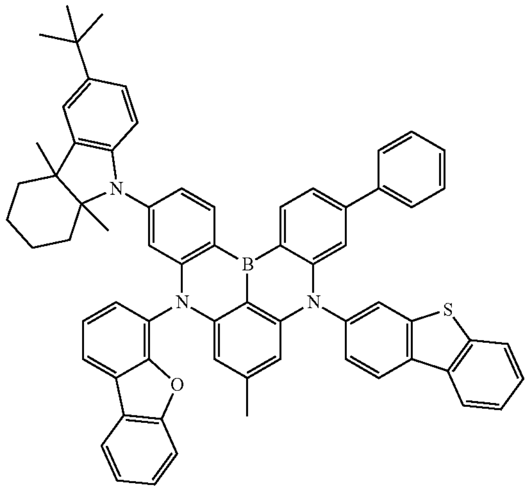
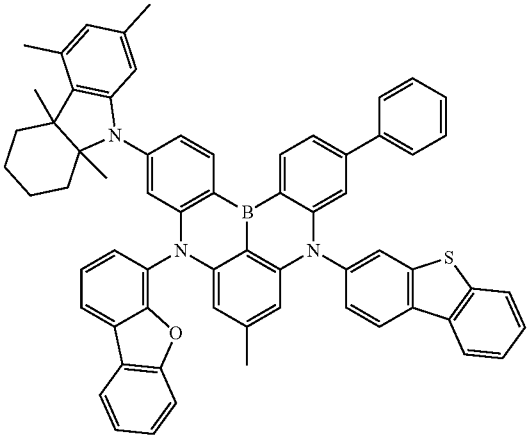
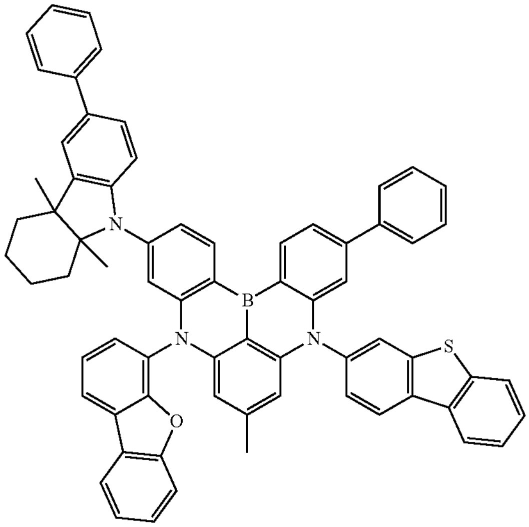

-continued
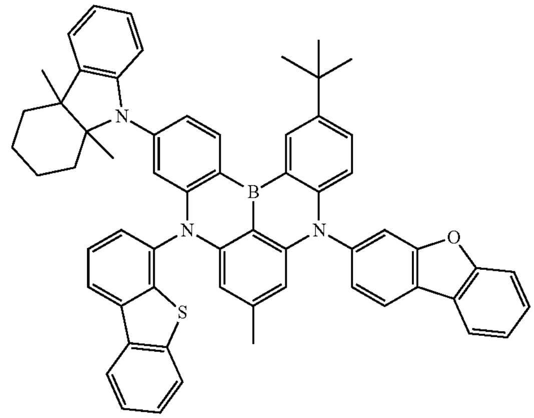
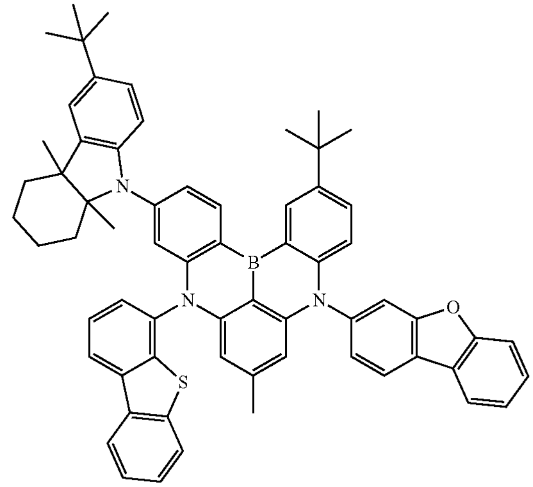
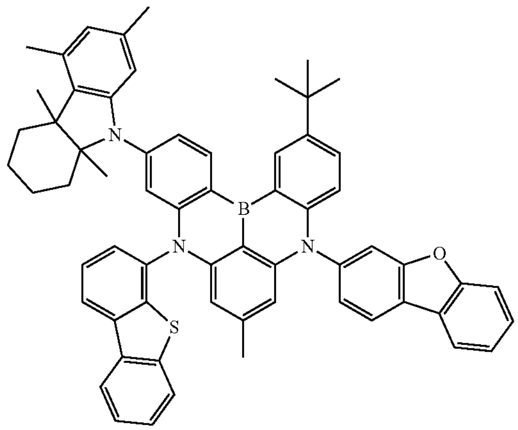
-continued
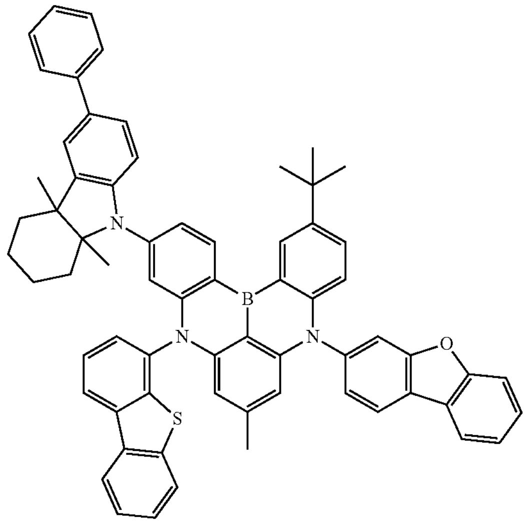
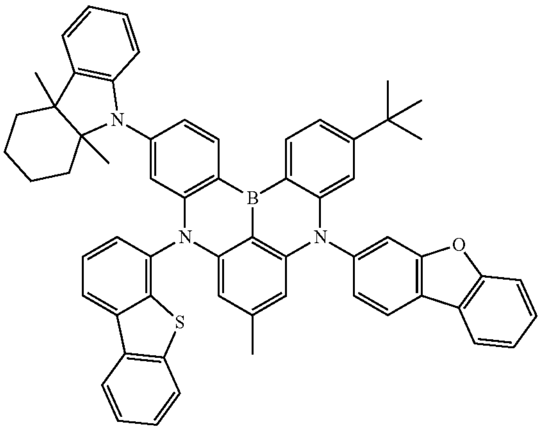
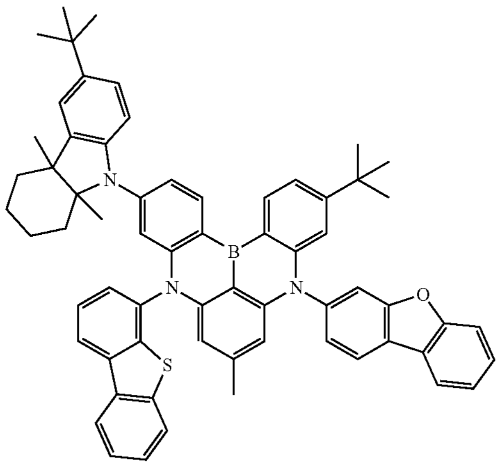

-continued
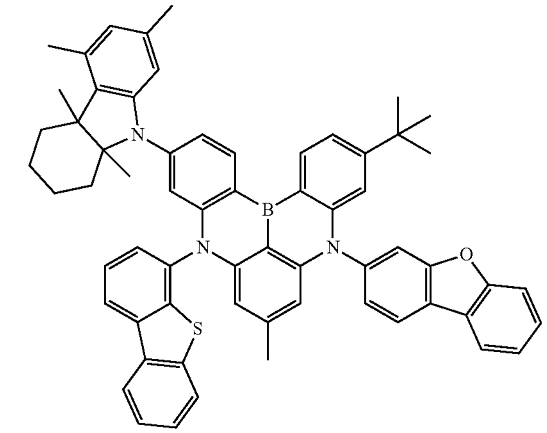
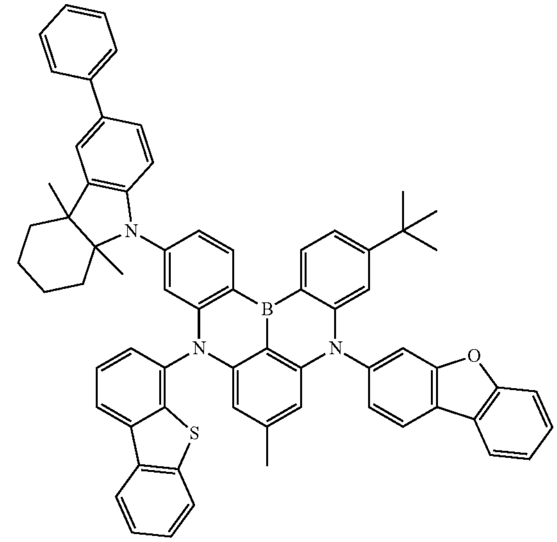
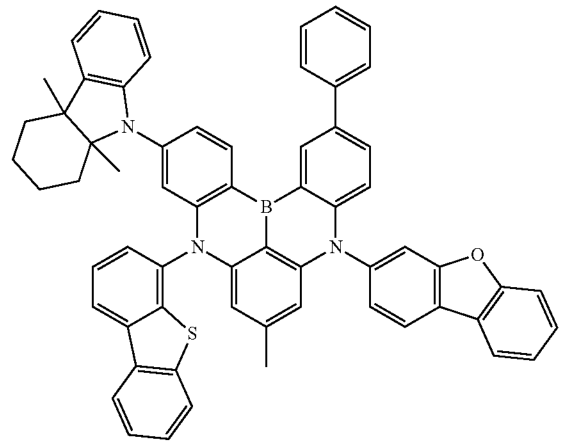
-continued
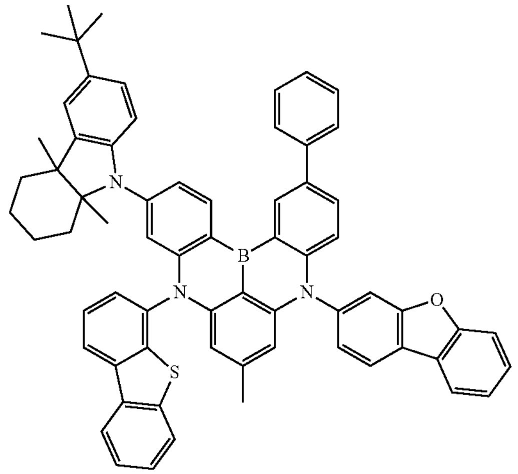
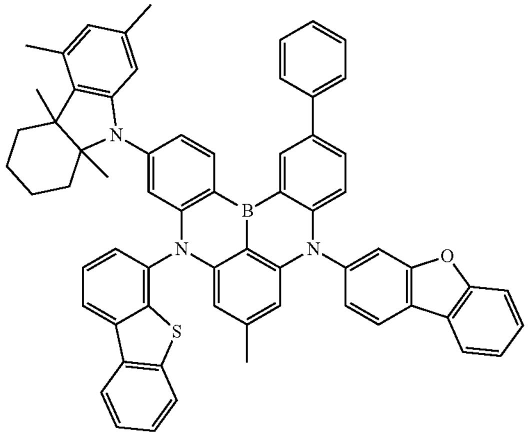
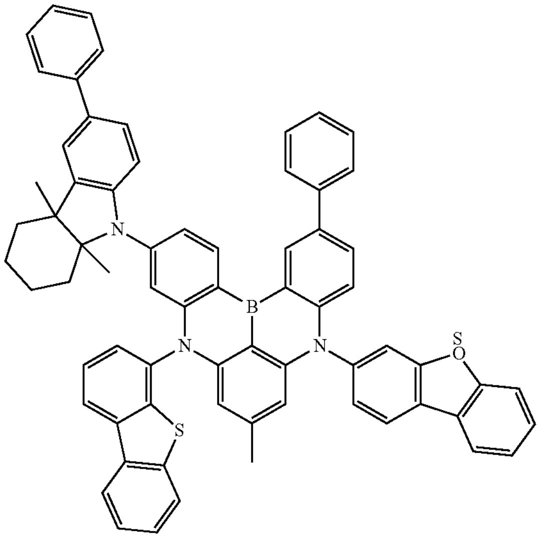

-continued
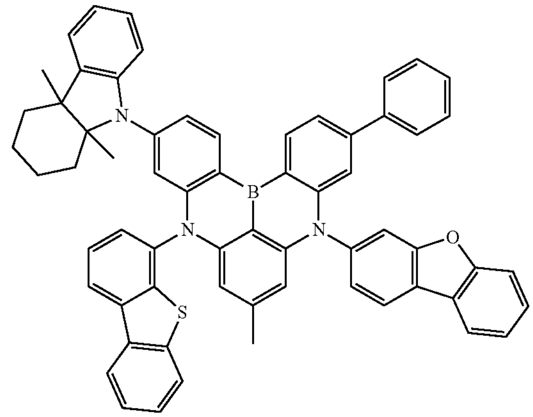
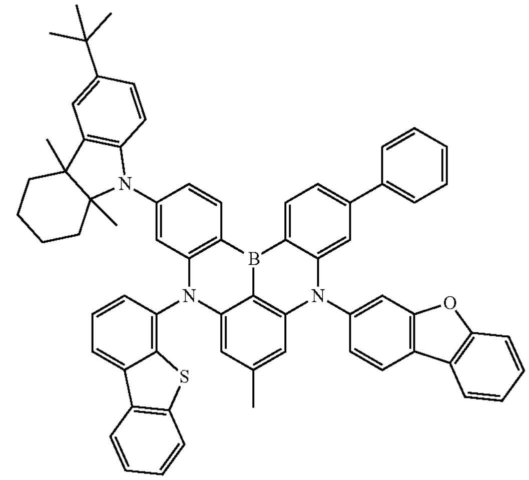
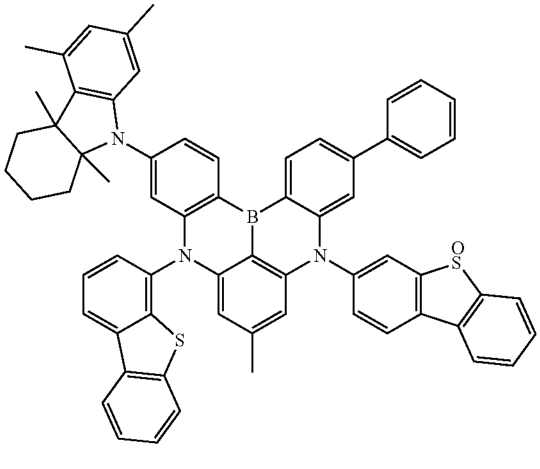
-continued
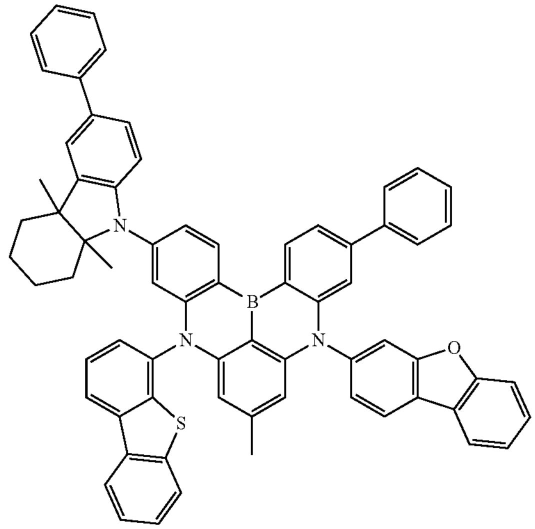
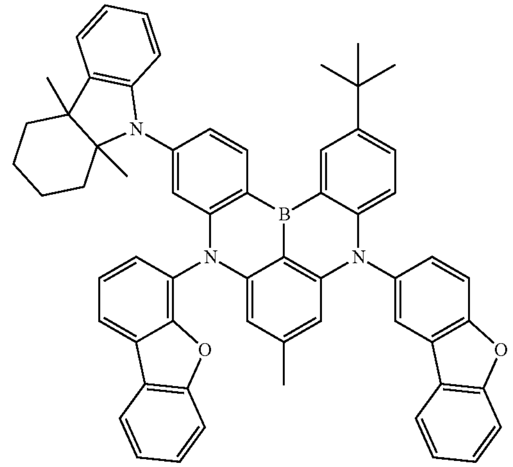
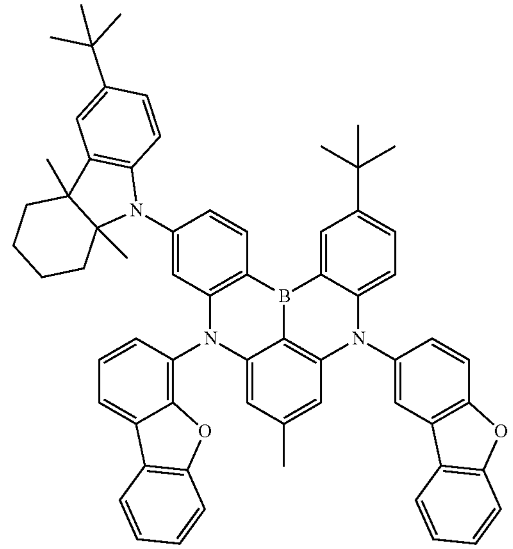

-continued
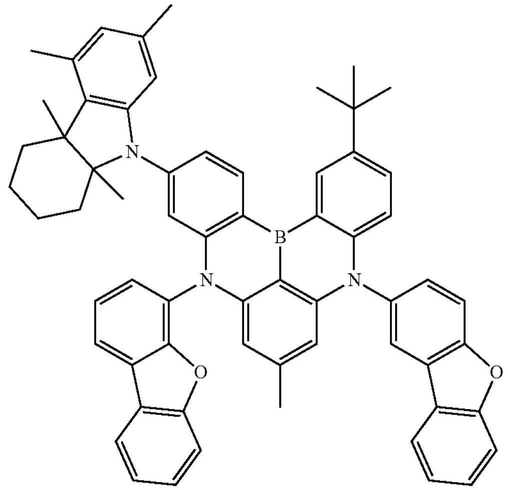
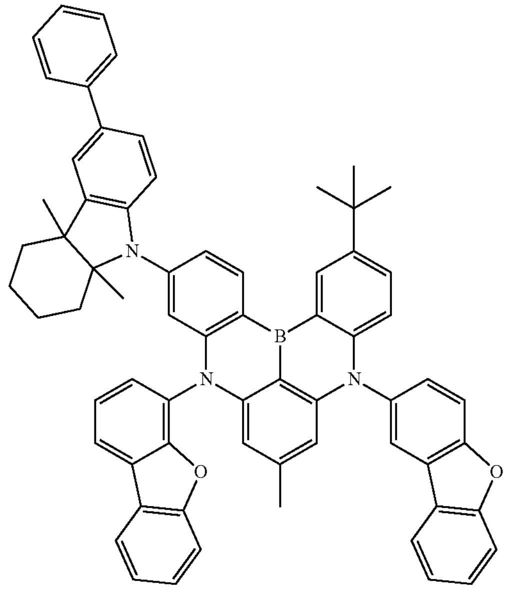
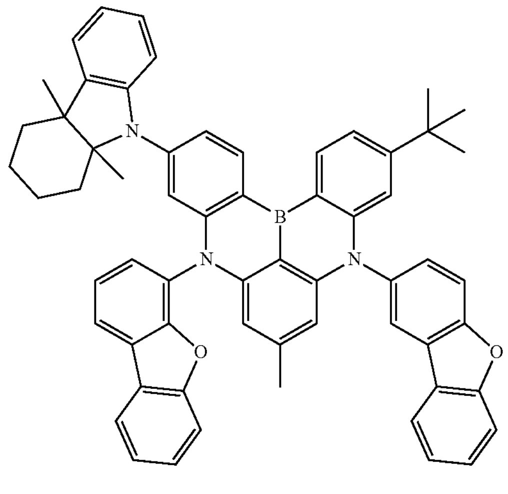
-continued
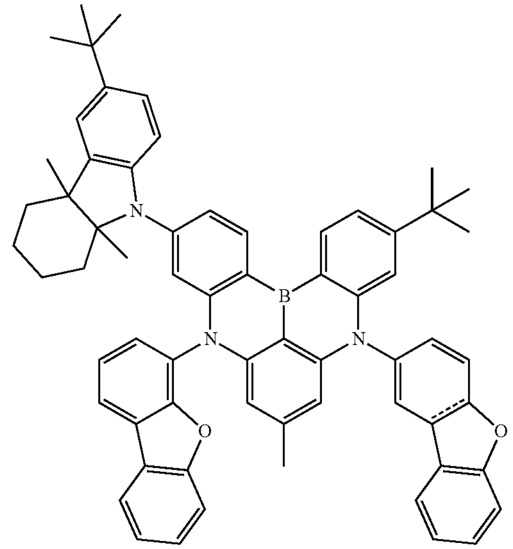
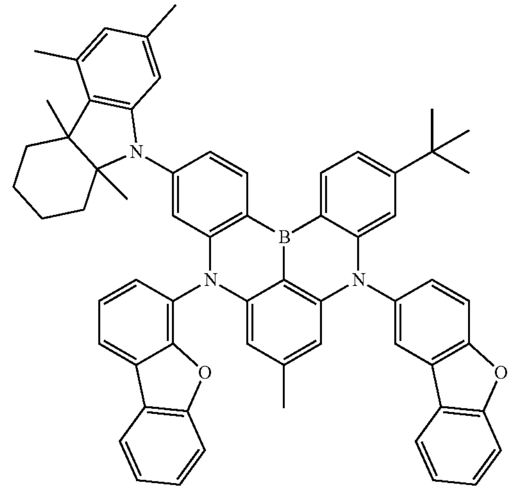
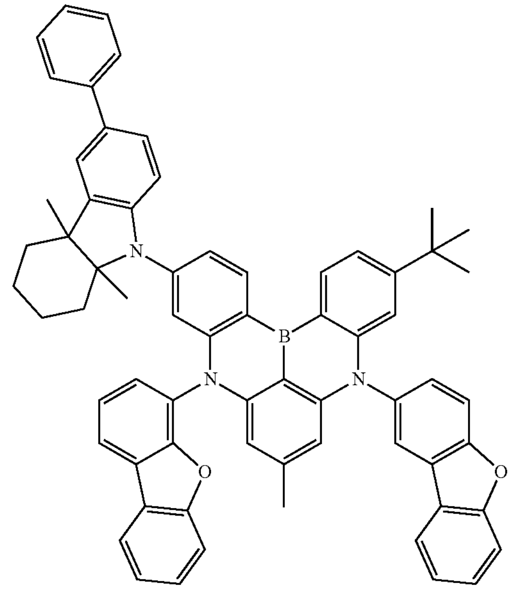

-continued
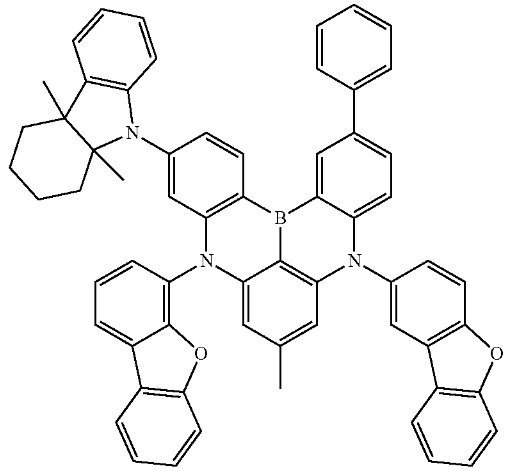
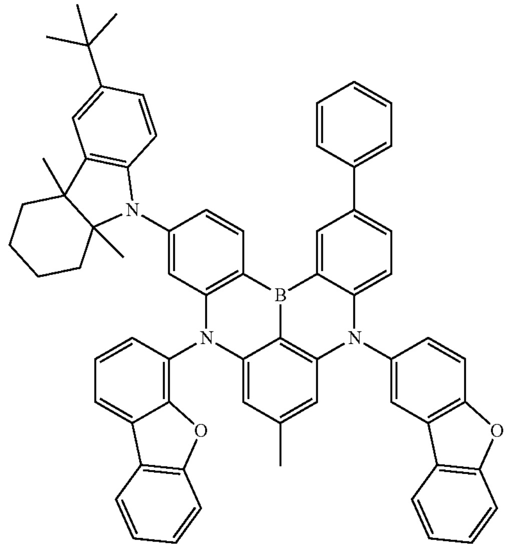
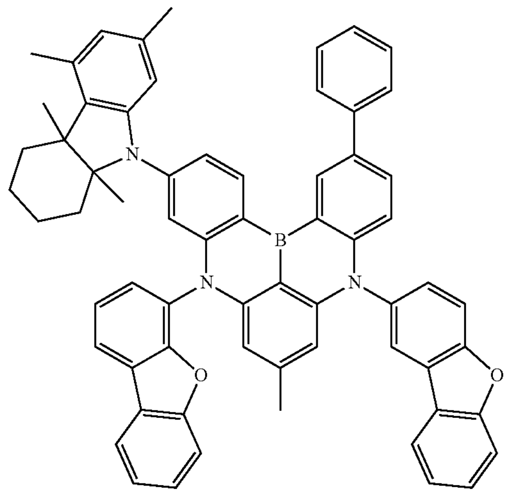
-continued
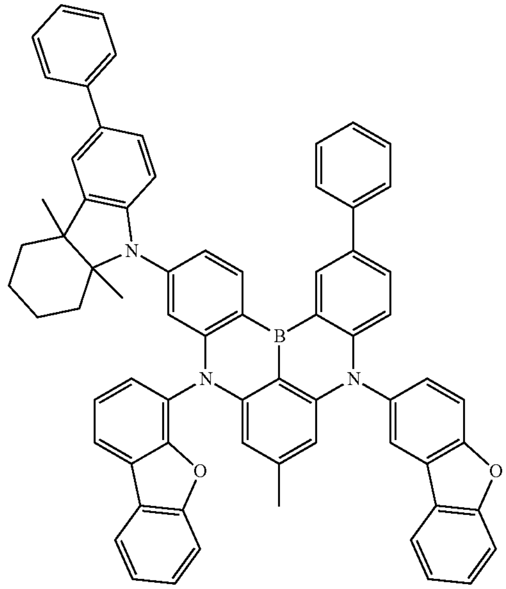
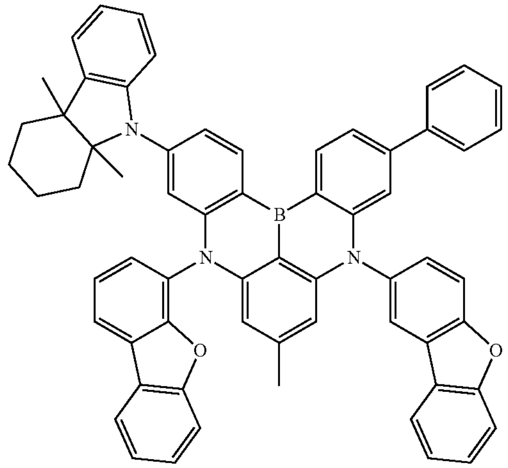
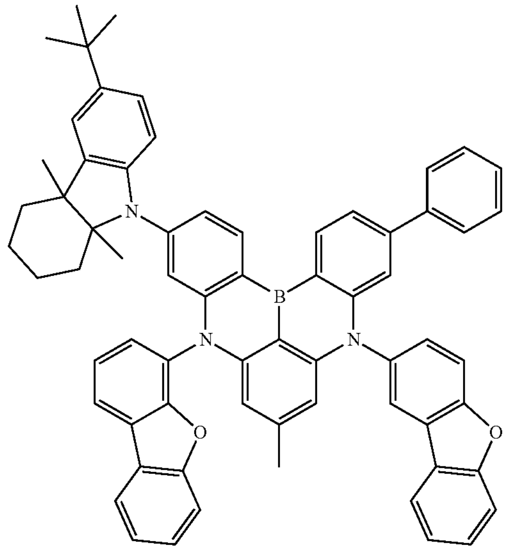

-continued
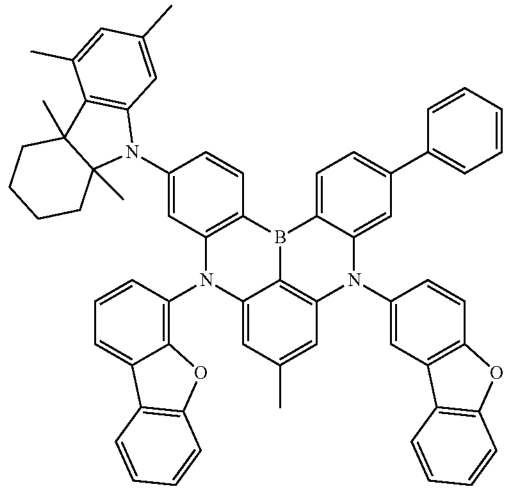
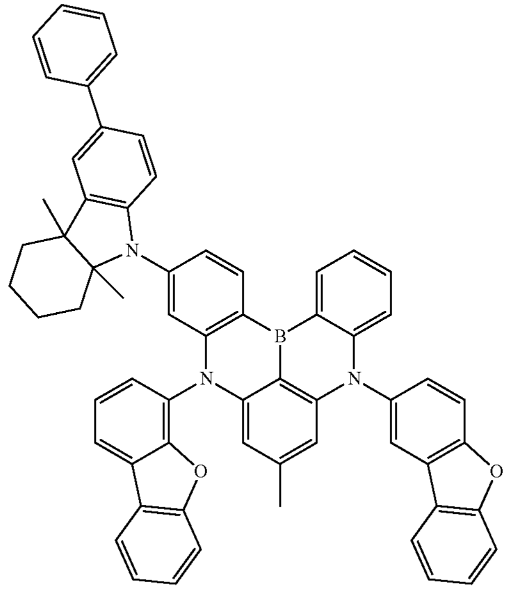
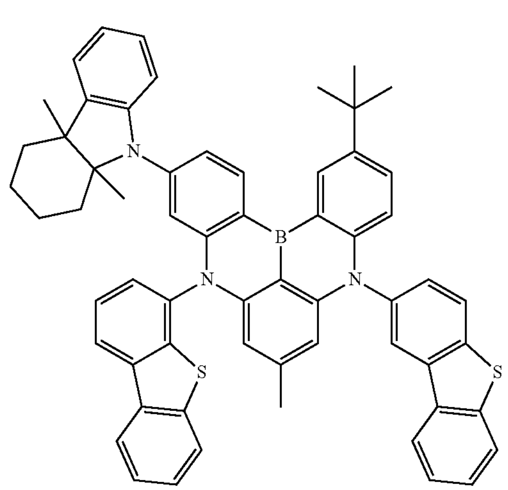
-continued
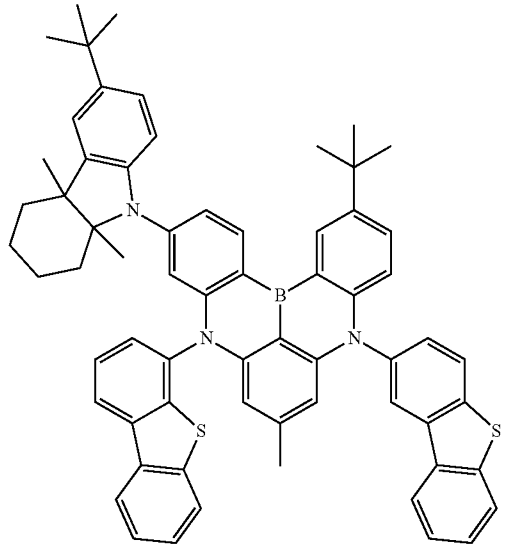
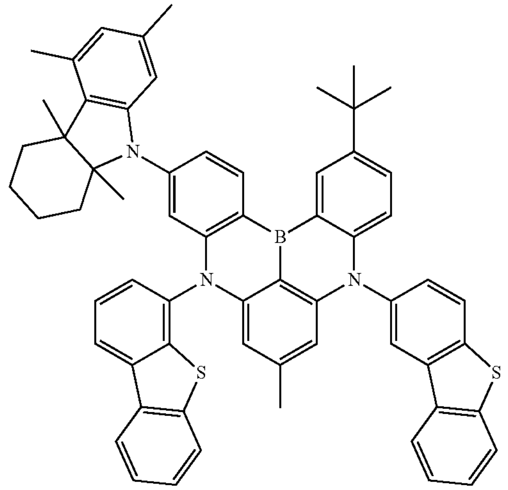
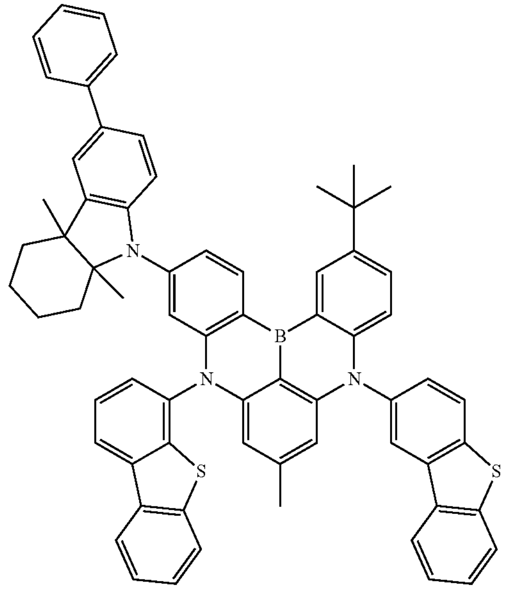

-continued
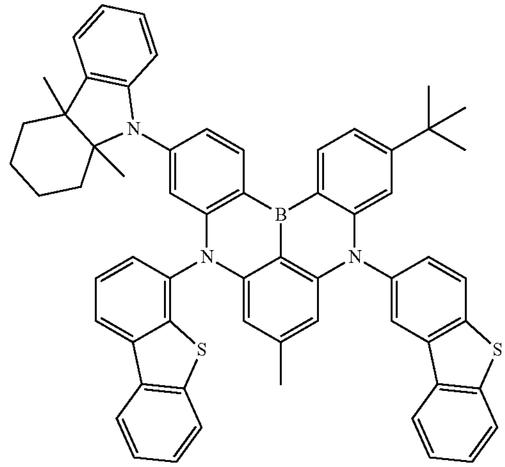
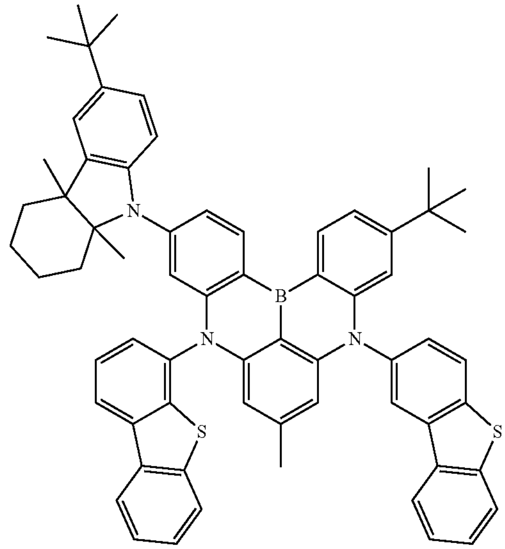
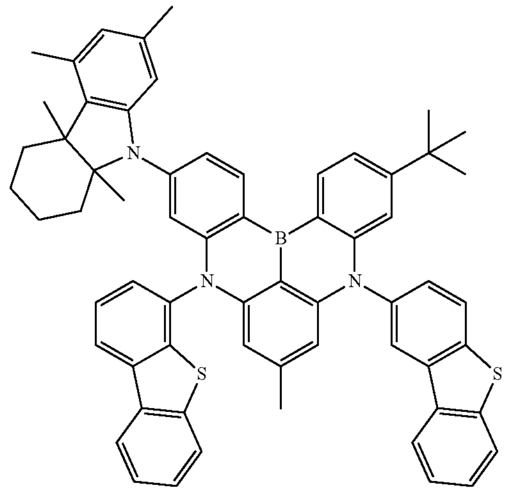
-continued
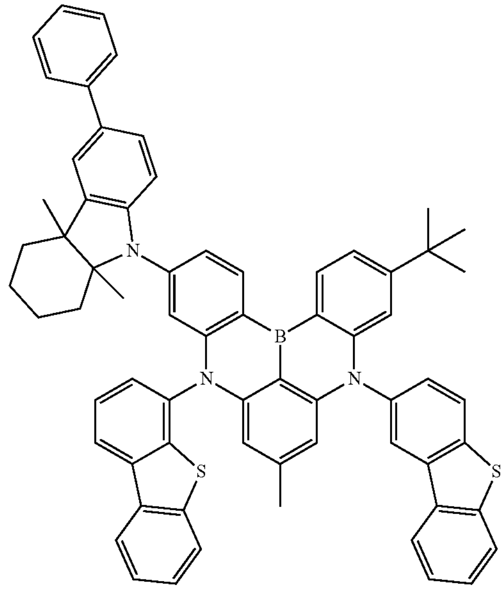
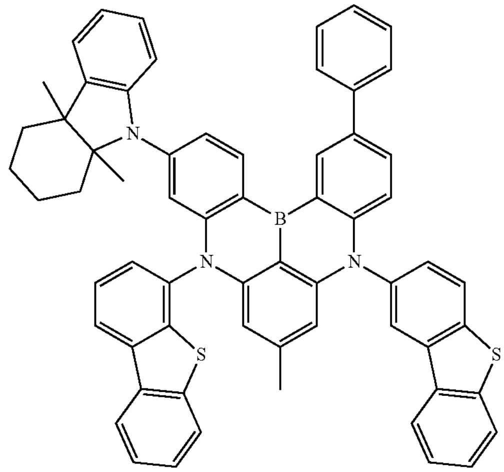
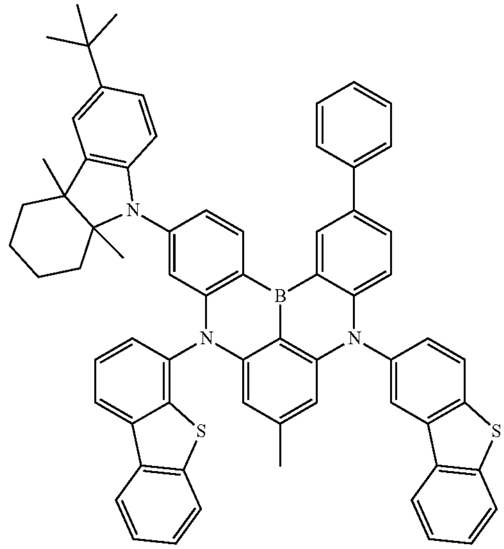

-continued
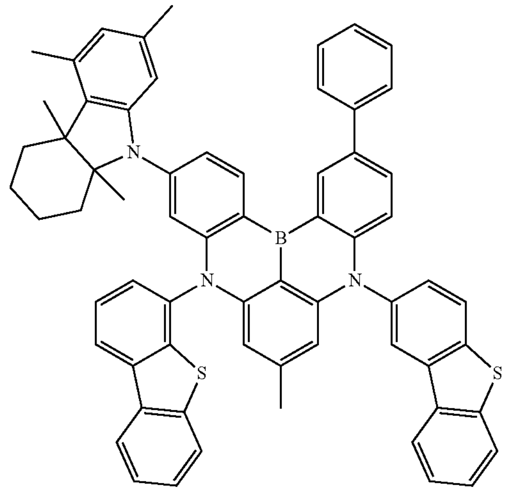
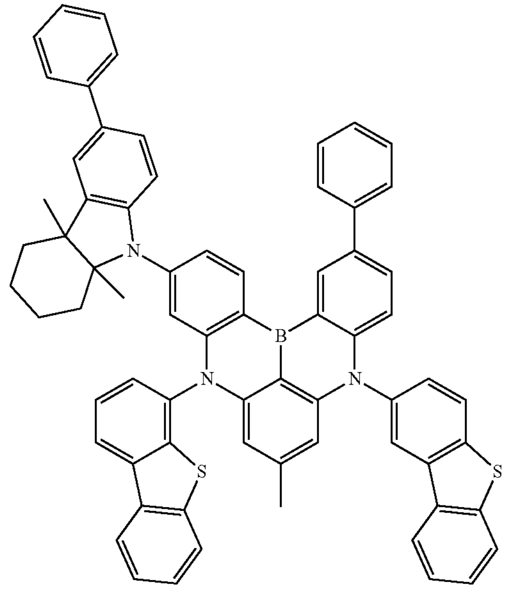
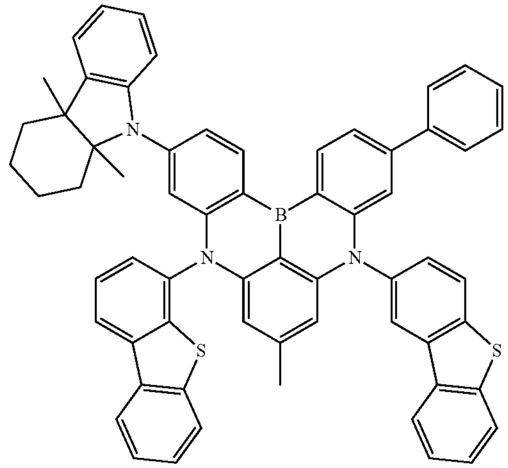
-continued
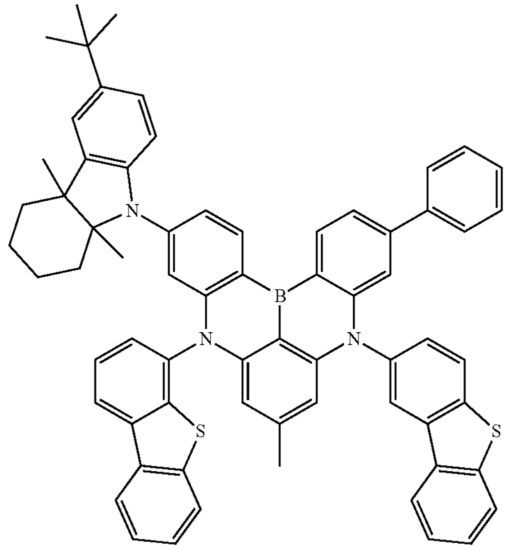
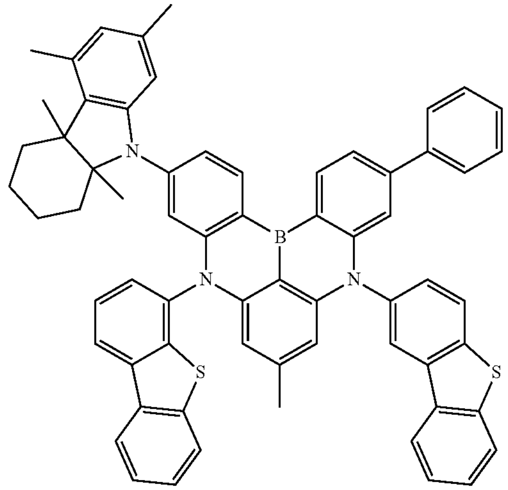
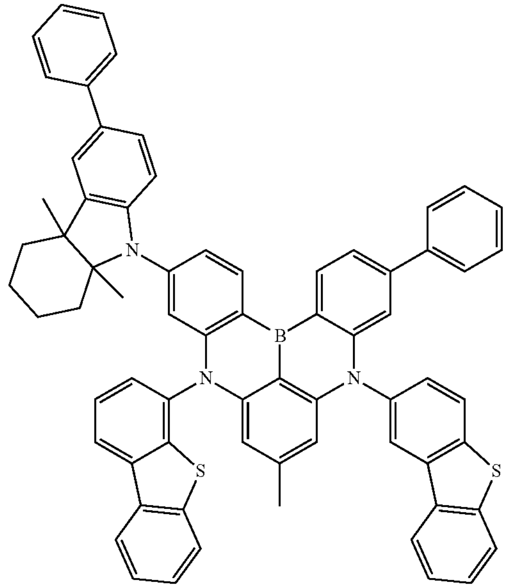

-continued
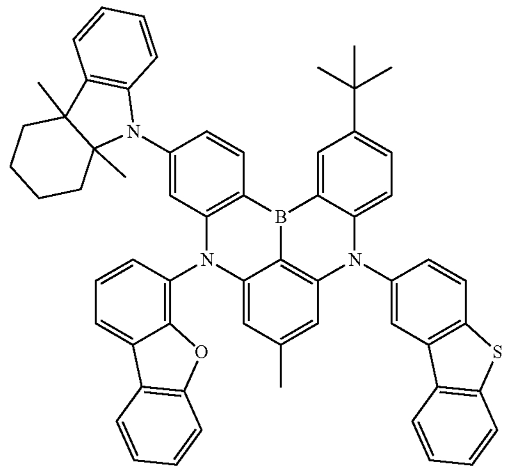
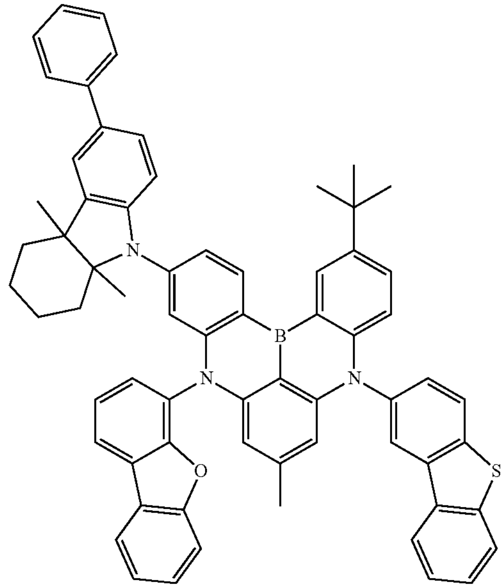
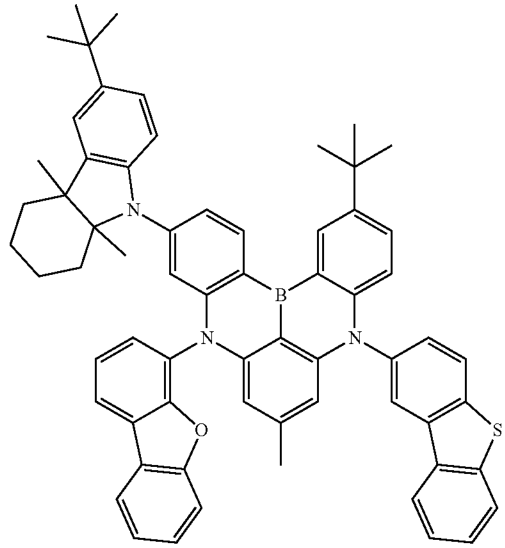
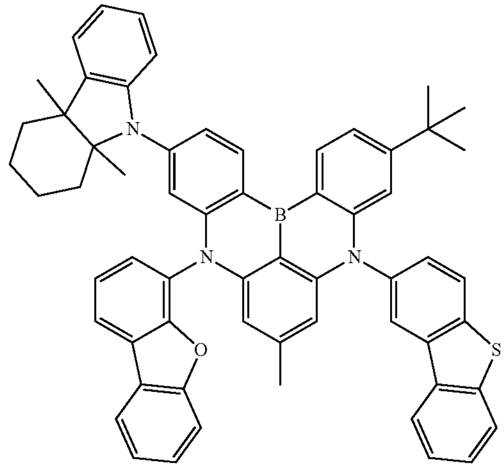
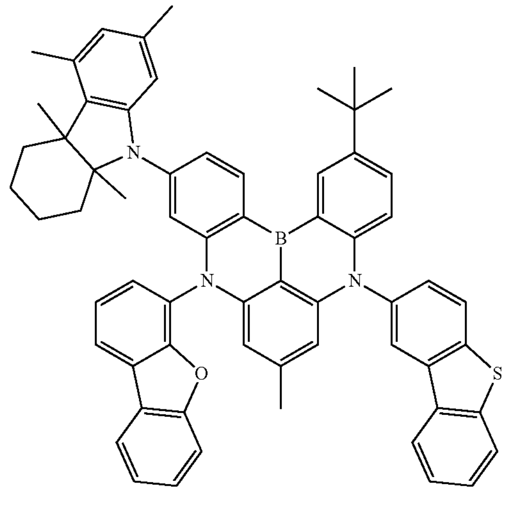
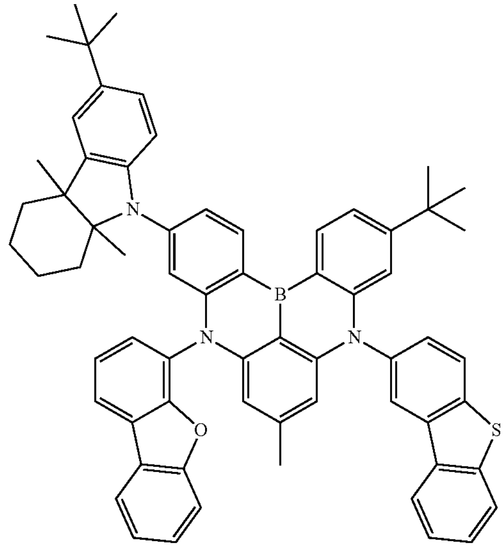

-continued
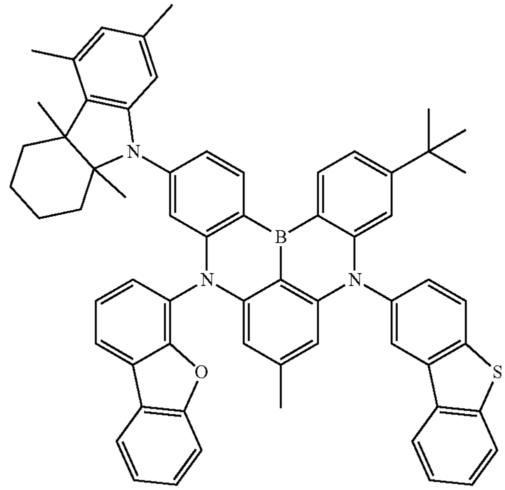
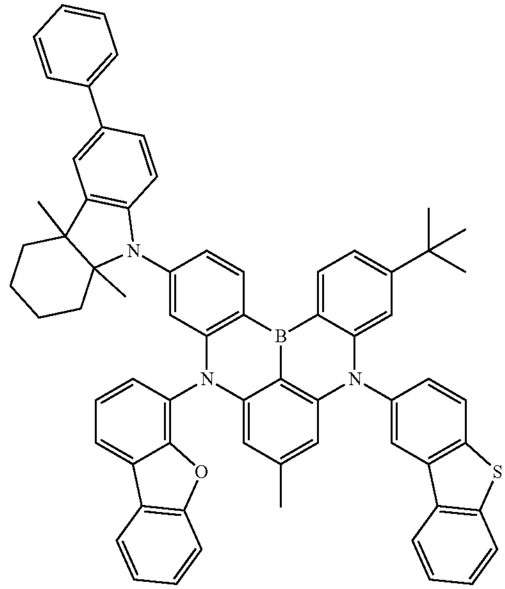
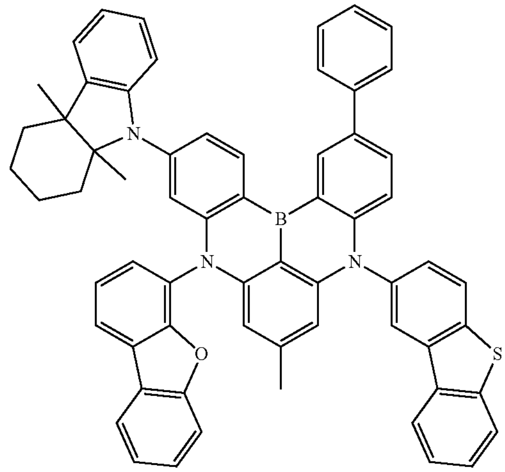
-continued
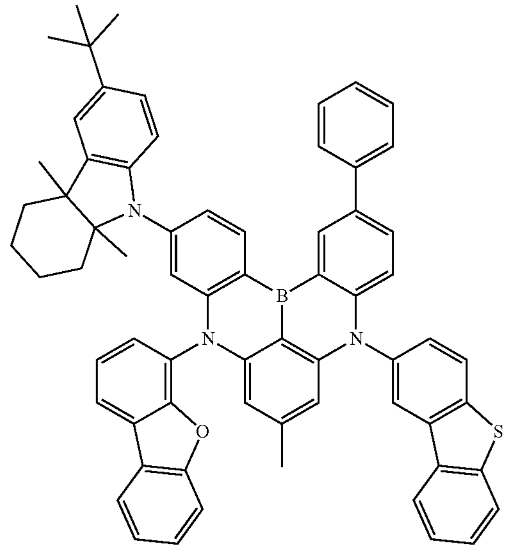
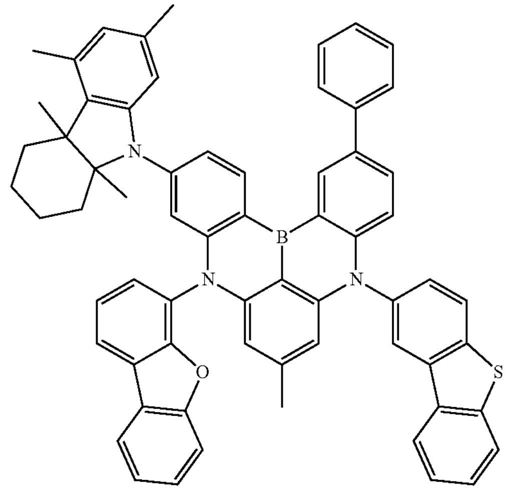
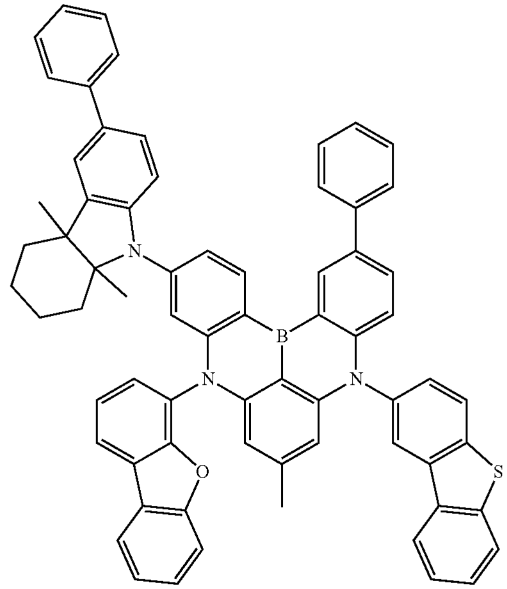

-continued
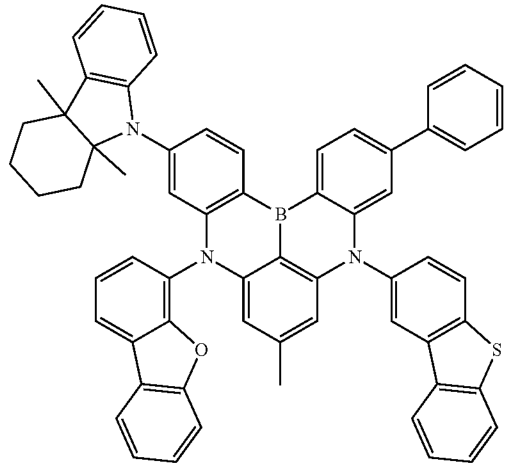
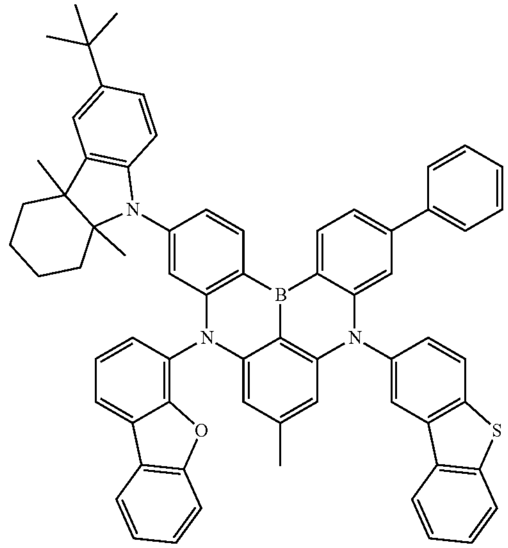
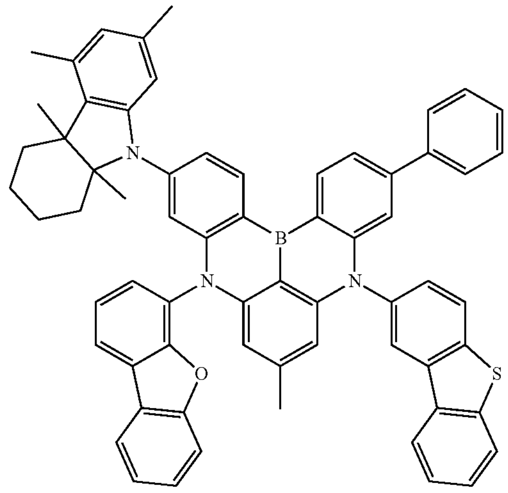
-continued
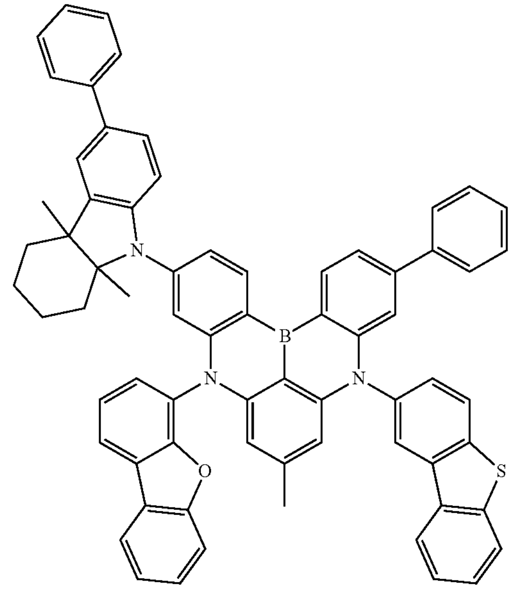
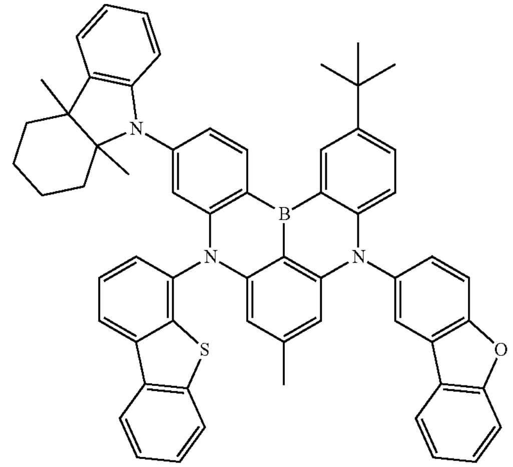
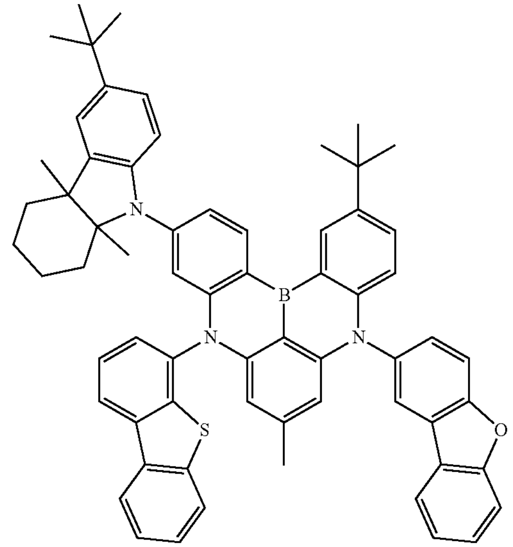

-continued
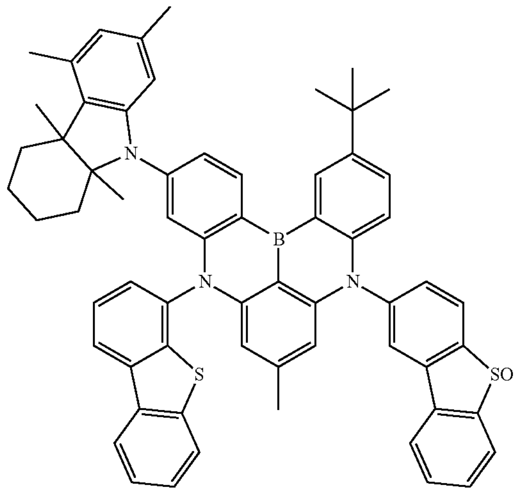
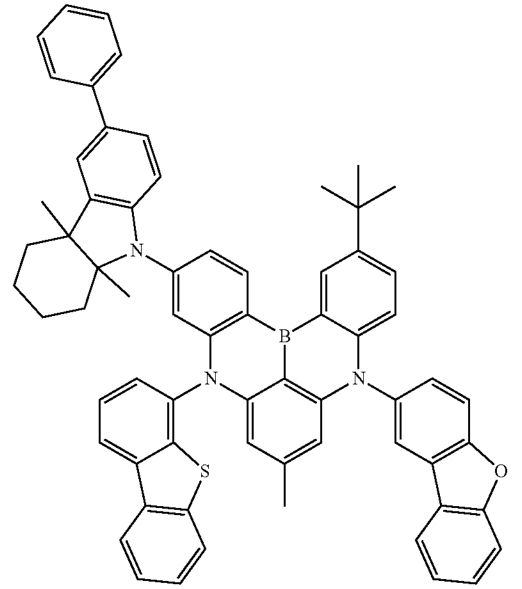
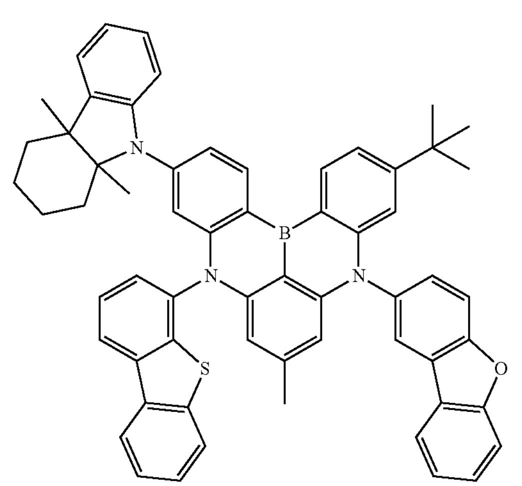
-continued
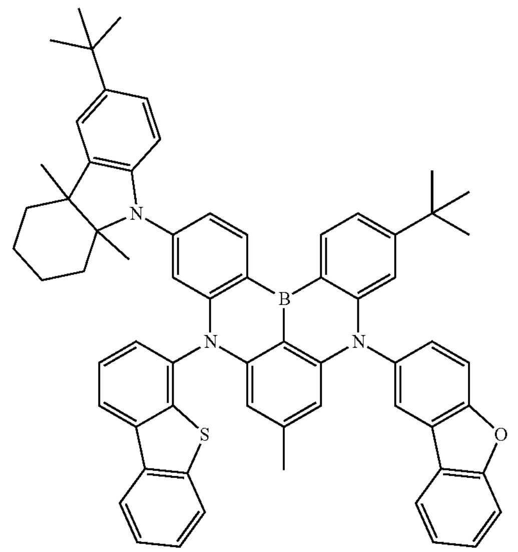
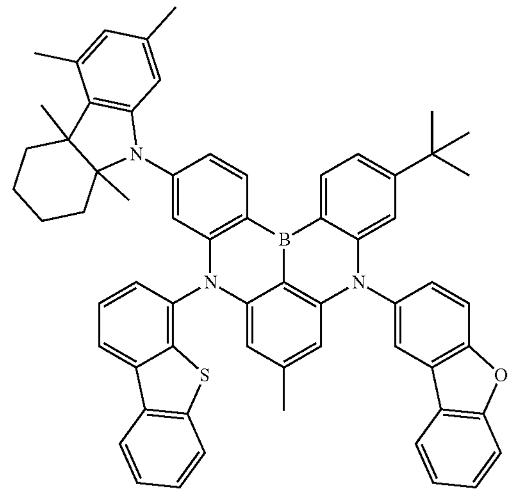
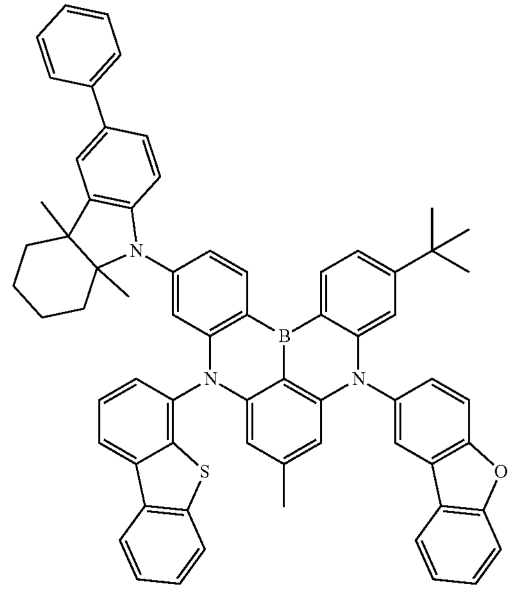

-continued
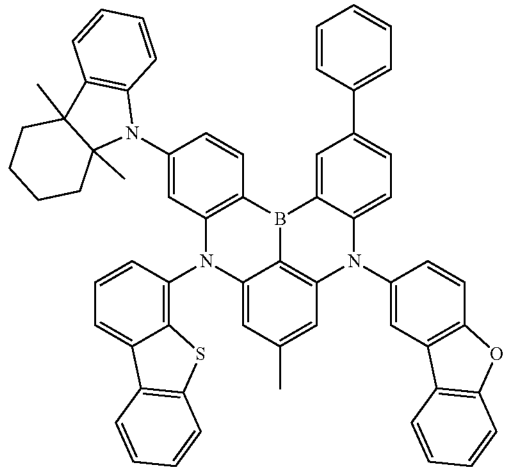
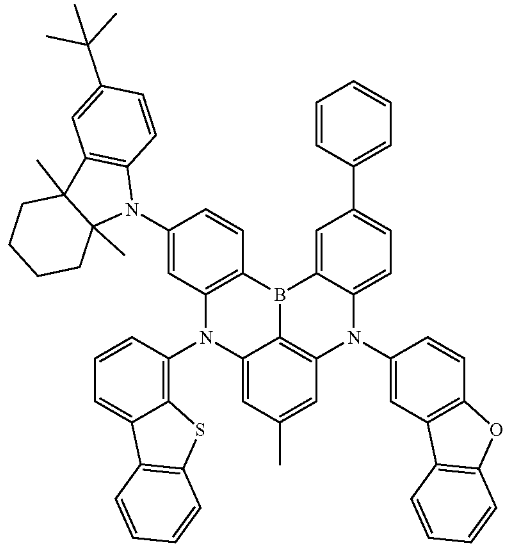
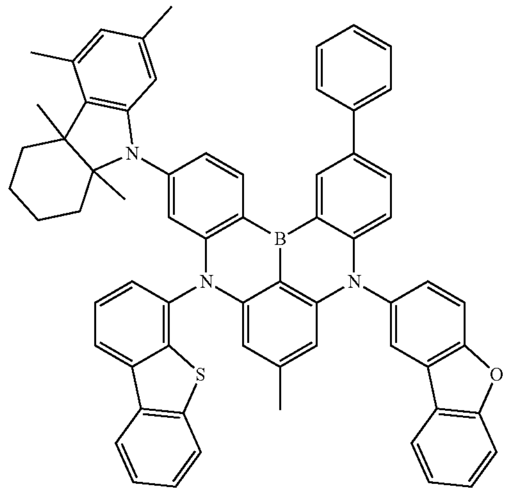
-continued
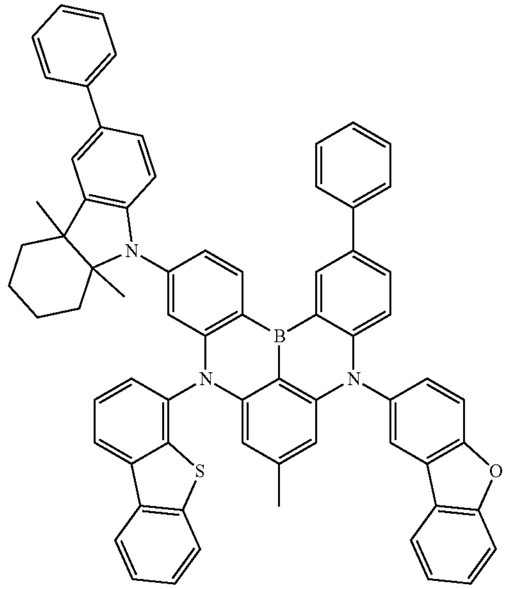
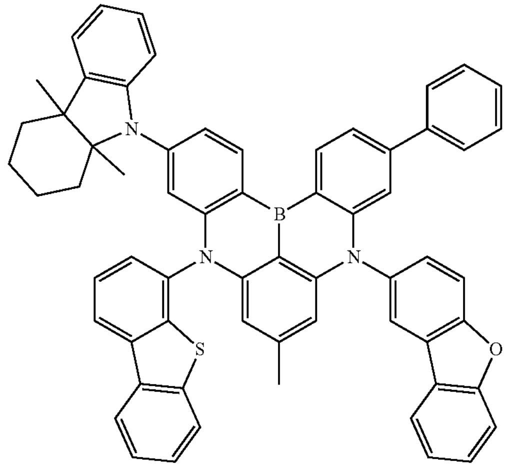
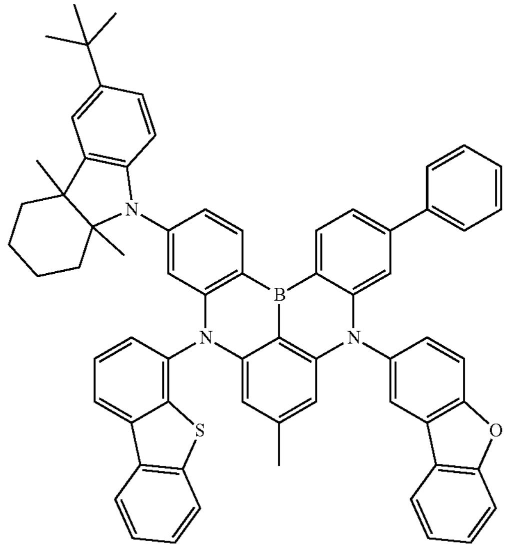

-continued
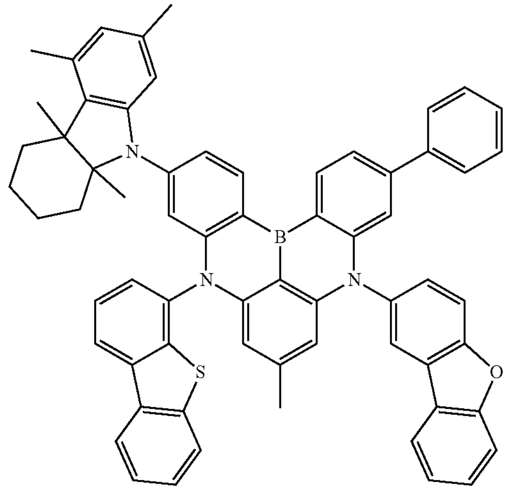
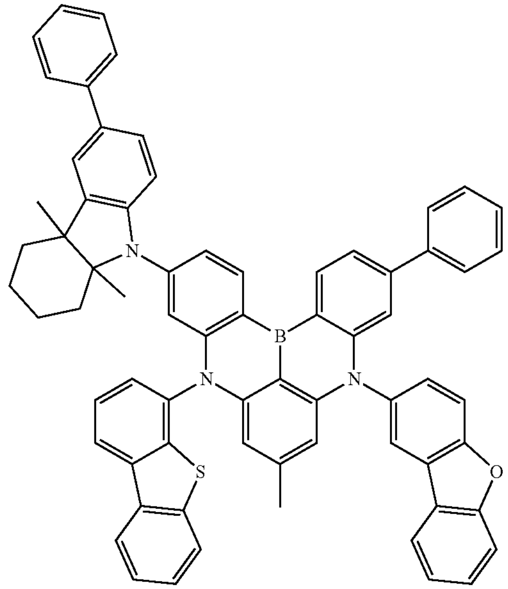
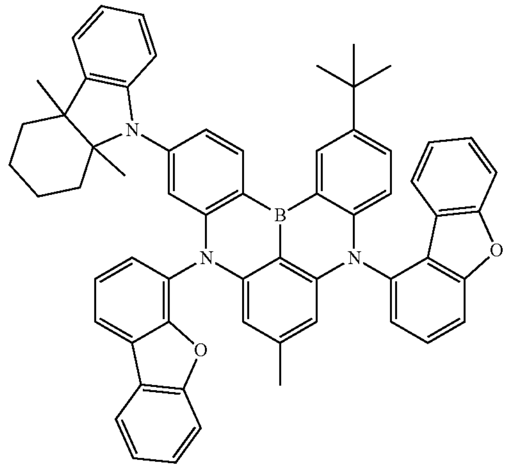
-continued
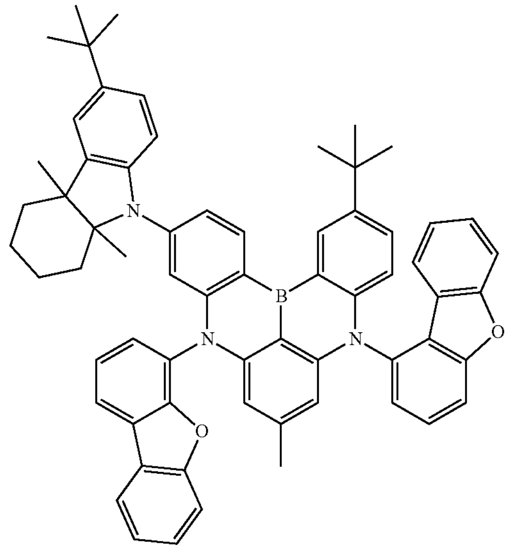
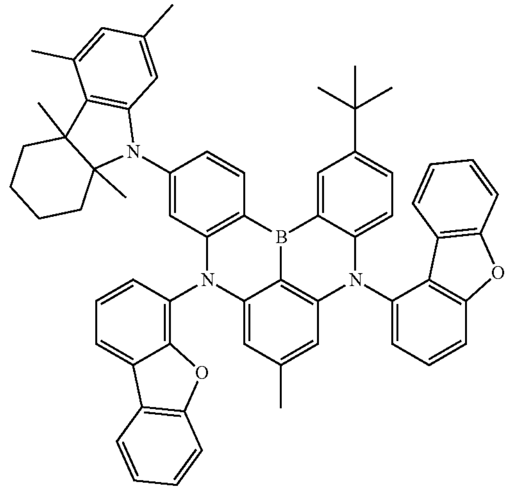
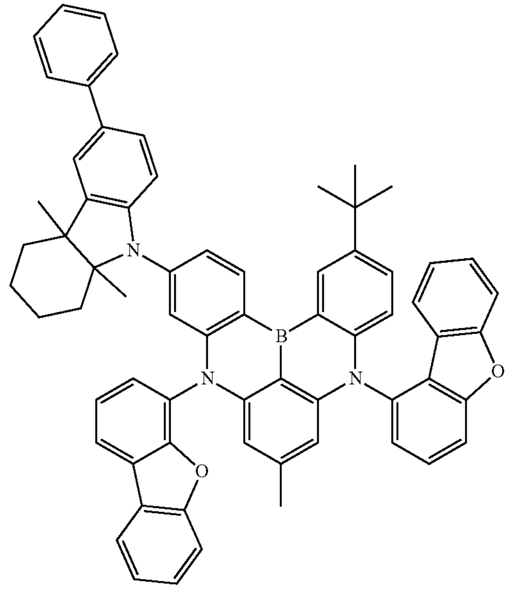

-continued
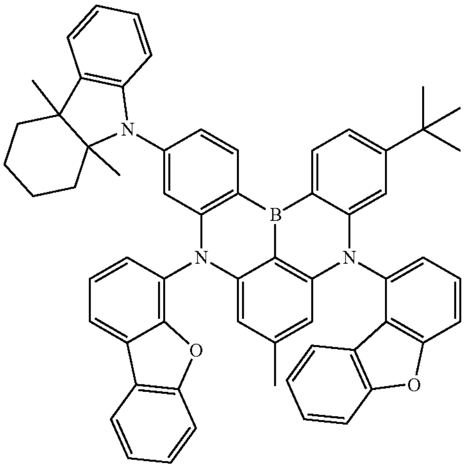
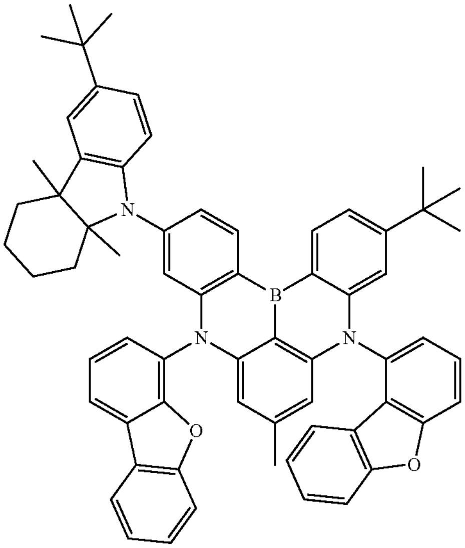
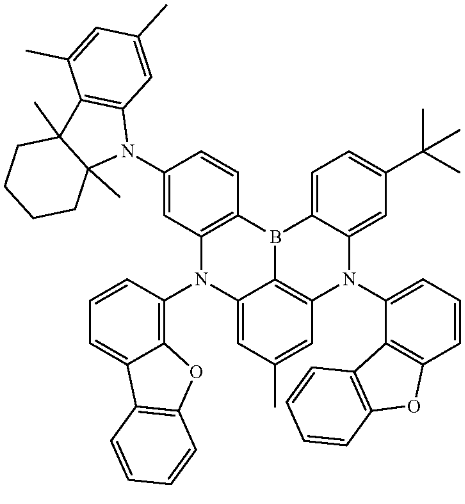
-continued
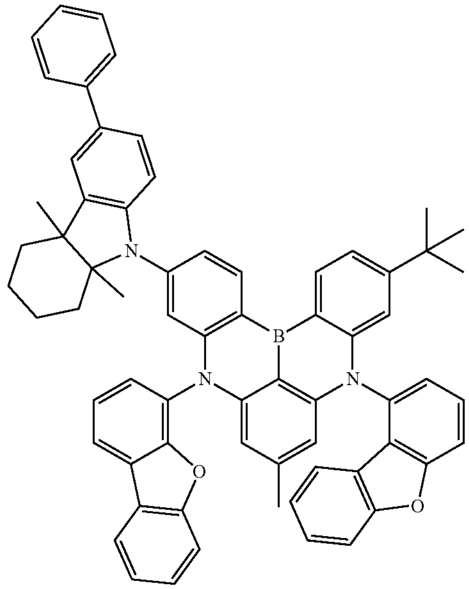
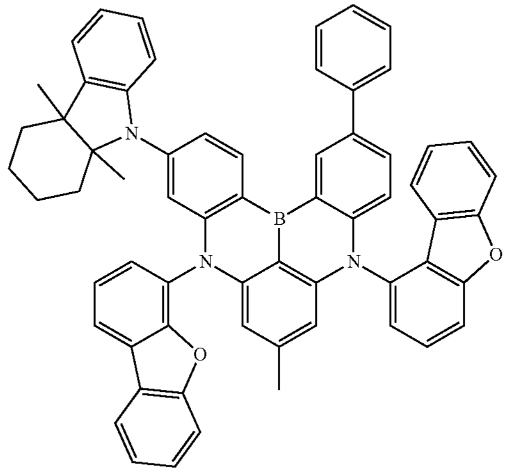
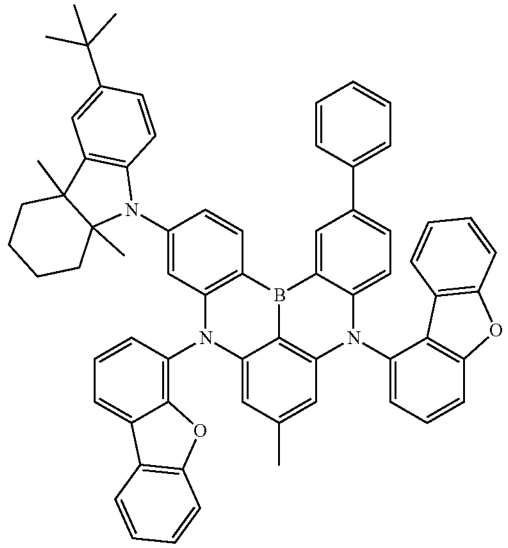

-continued
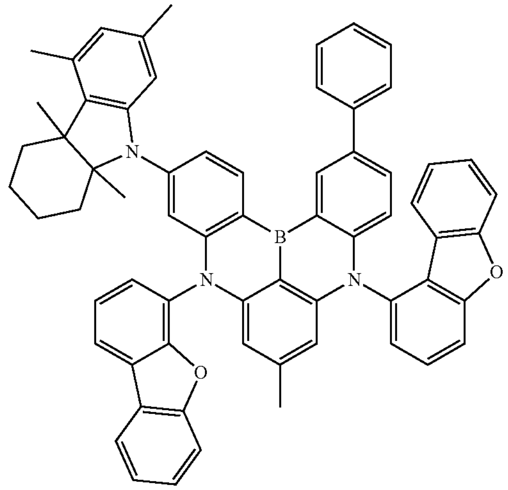
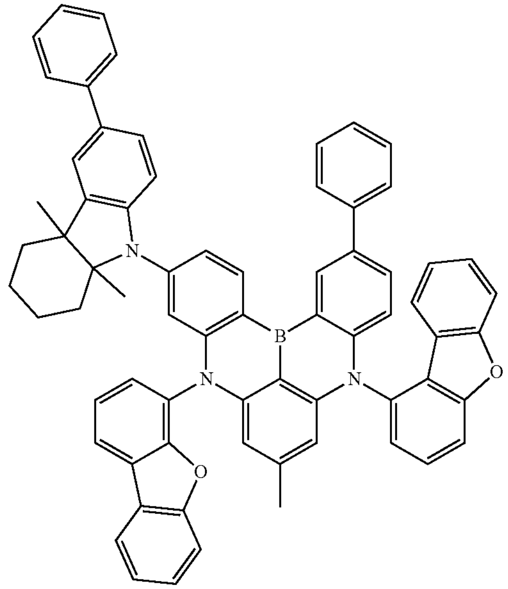
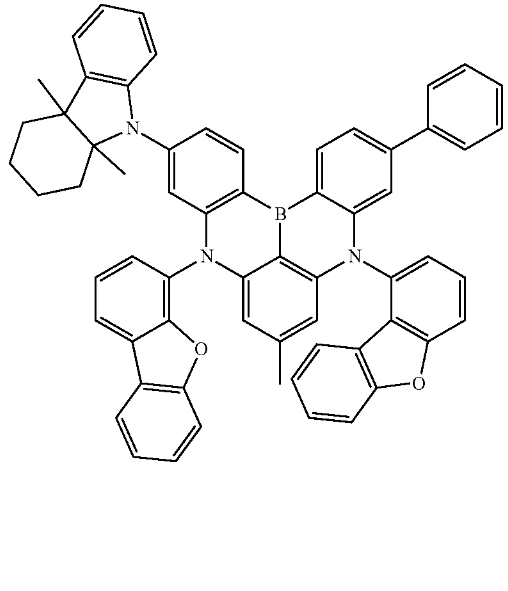
-continued
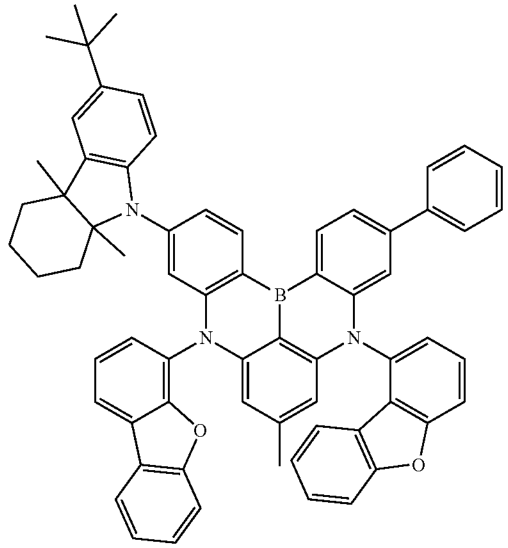
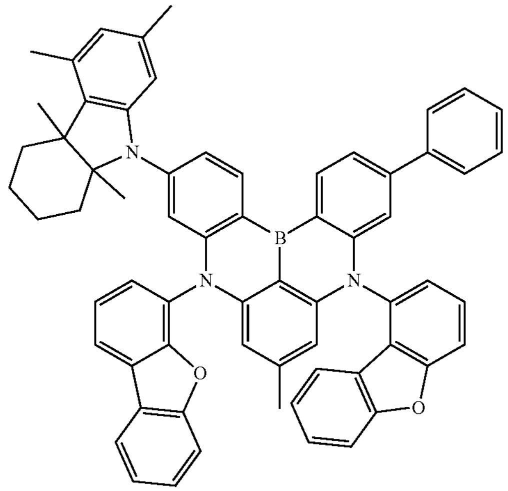
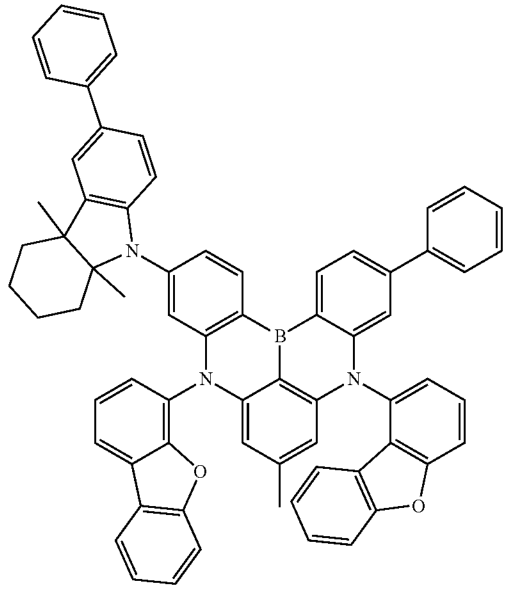

-continued
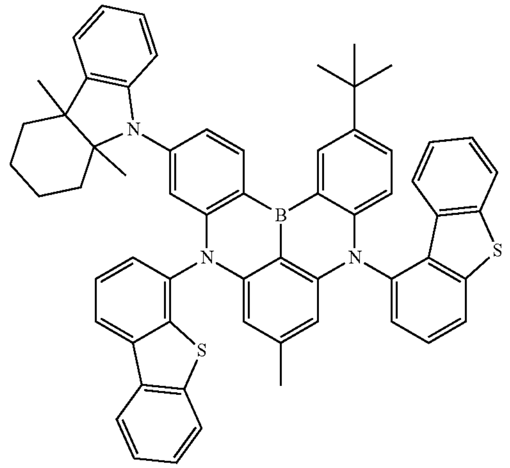
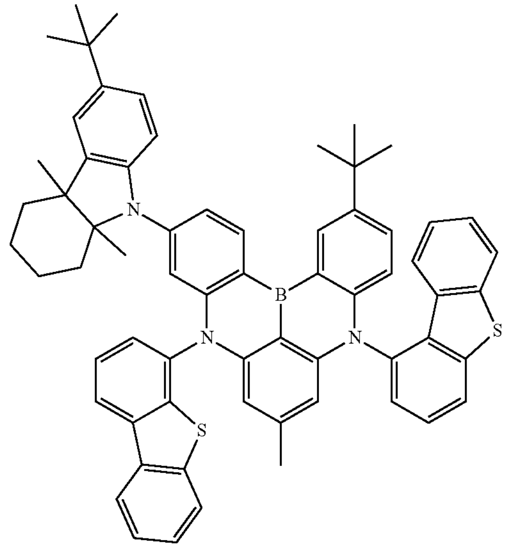
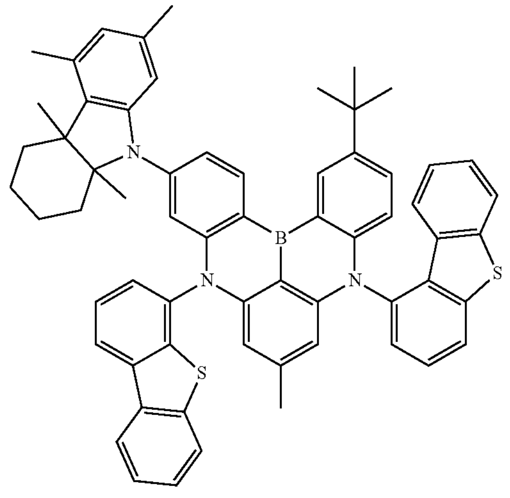
-continued
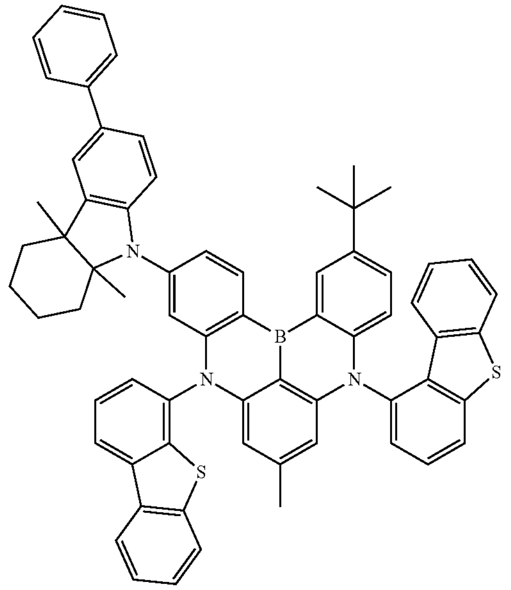
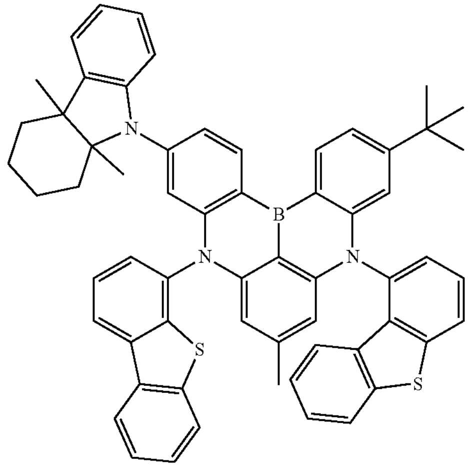
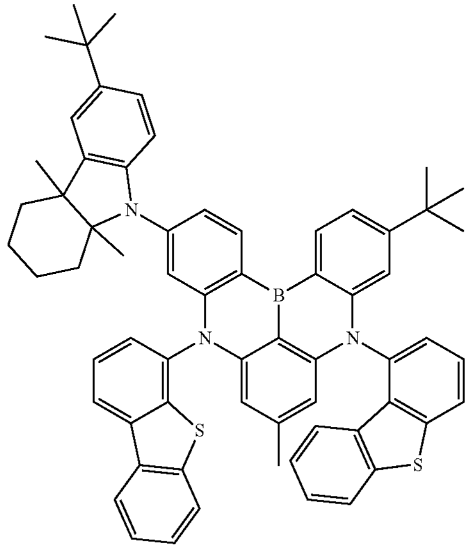

-continued
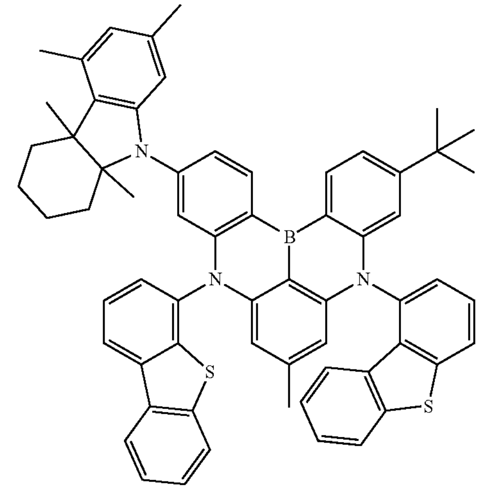
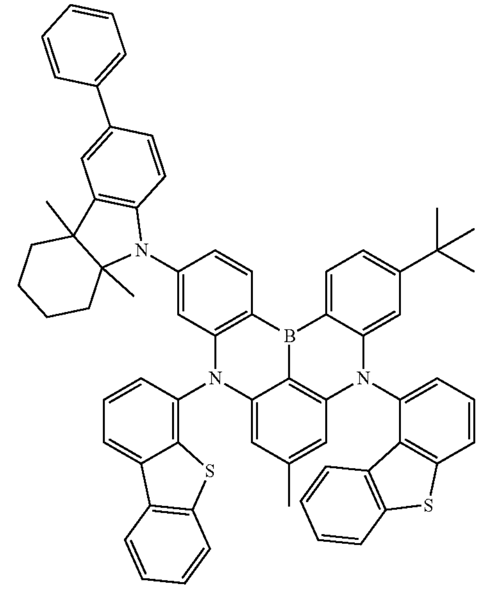
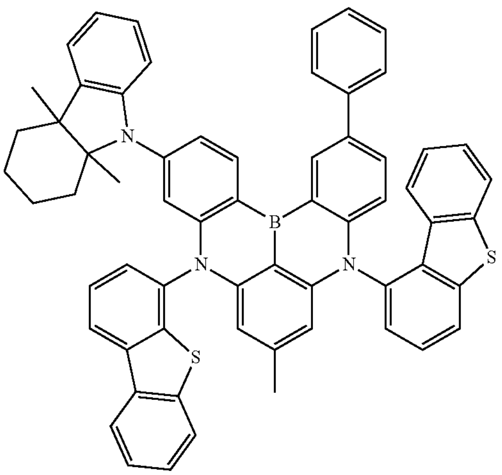
-continued
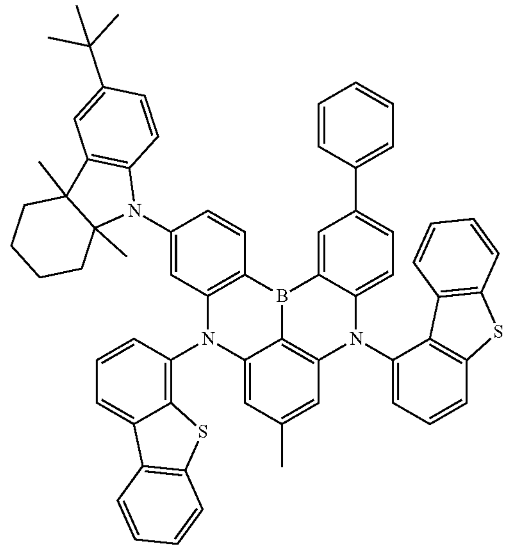
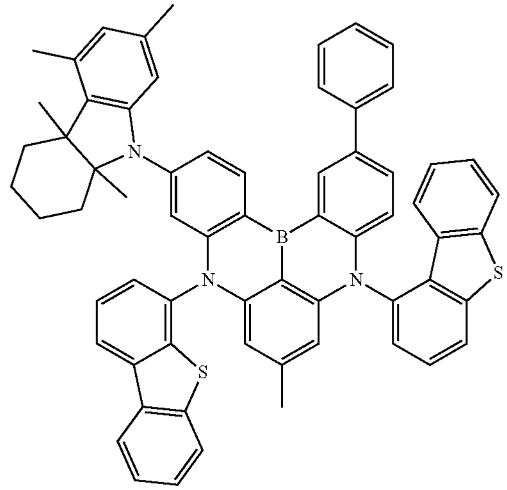
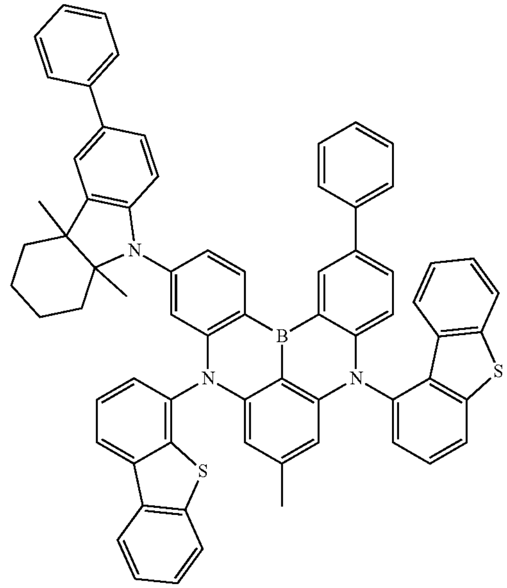

-continued
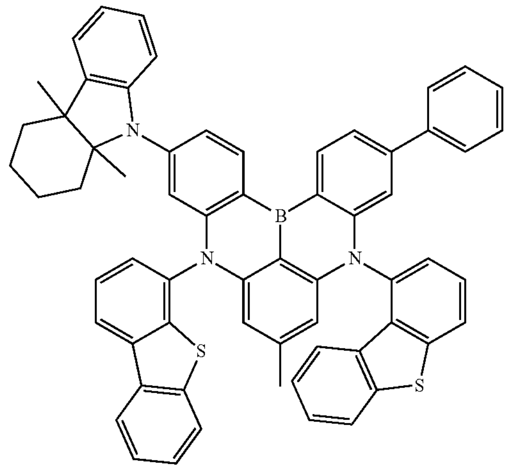
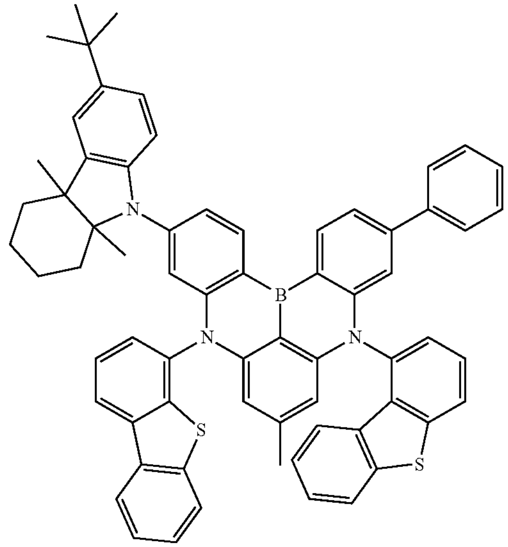
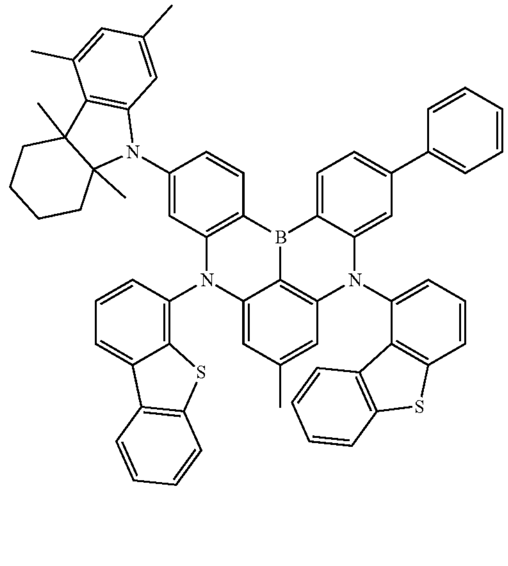
-continued
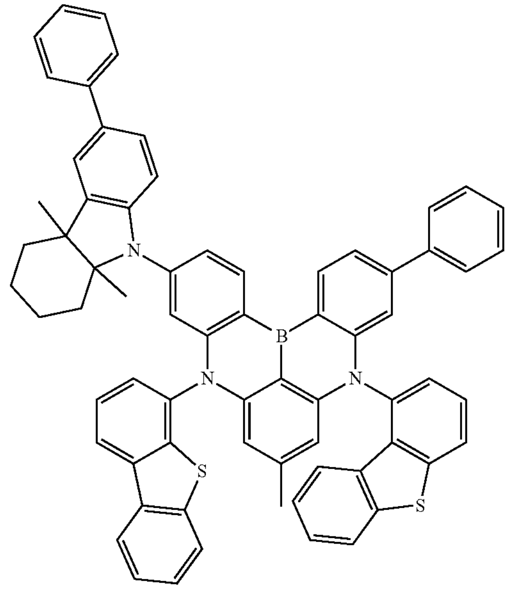
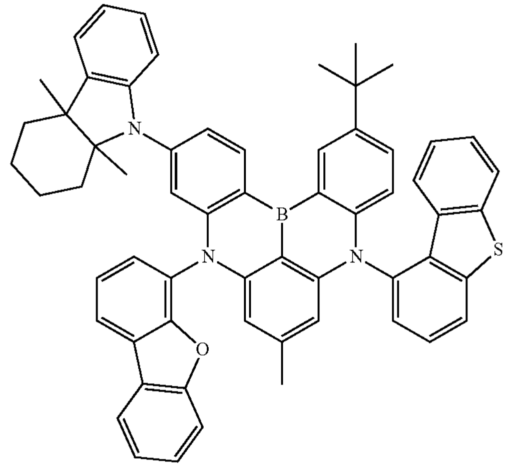
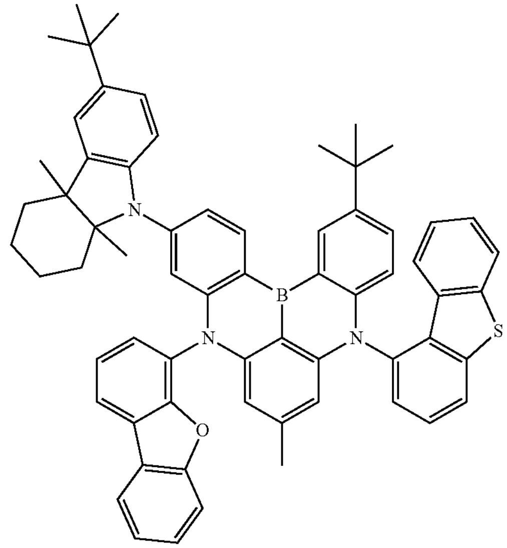

-continued
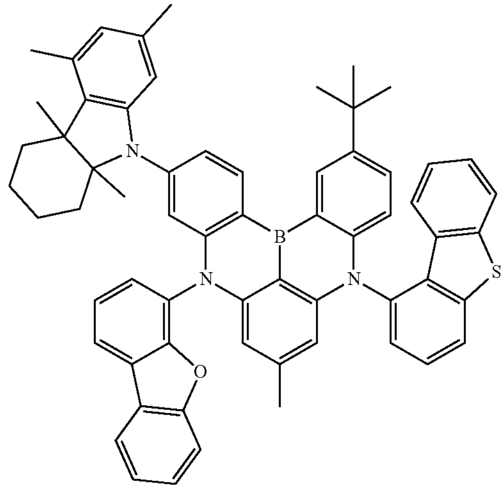
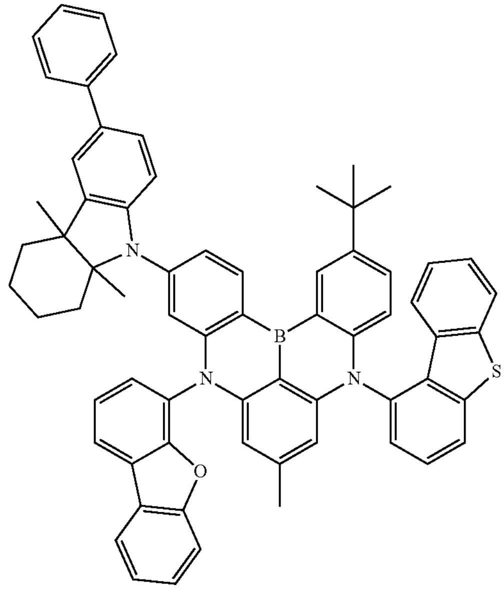
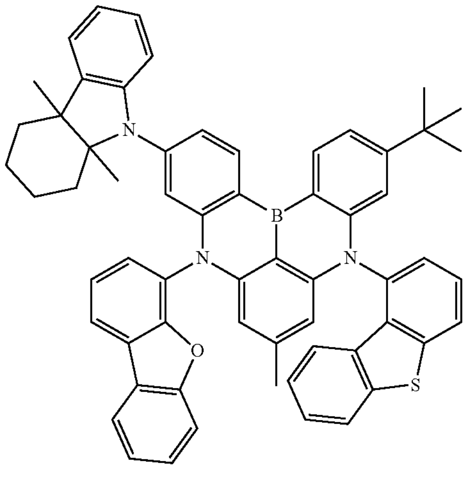
-continued
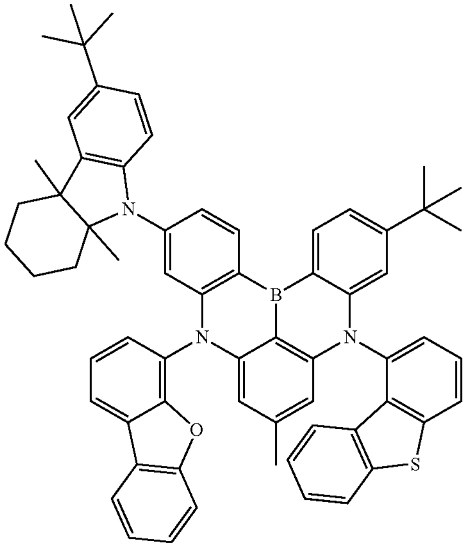
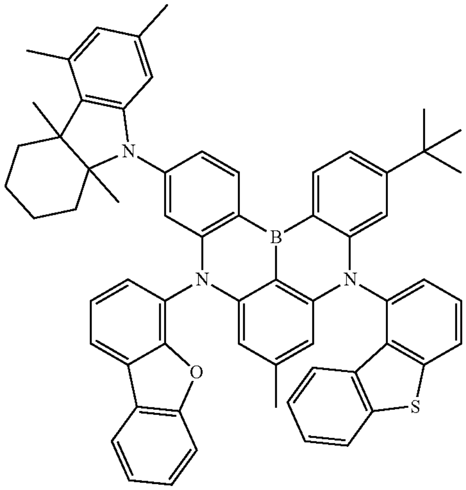
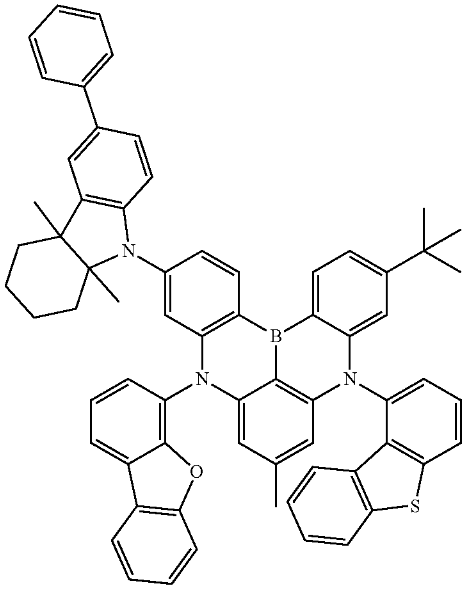

-continued
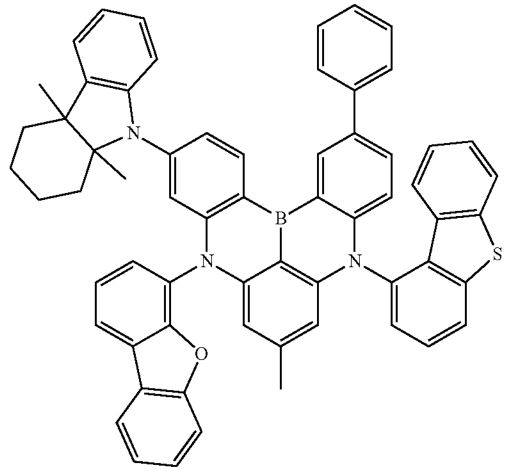
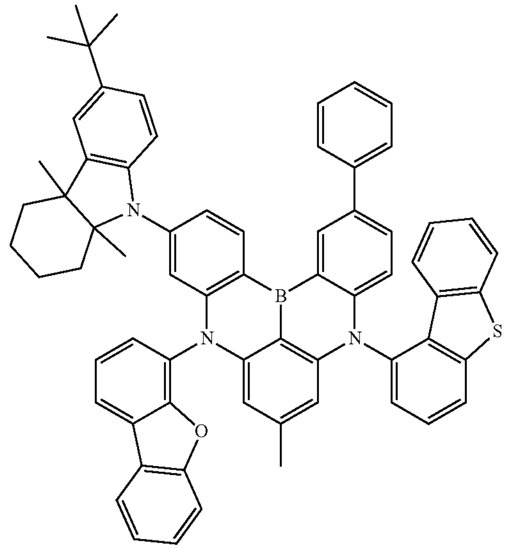
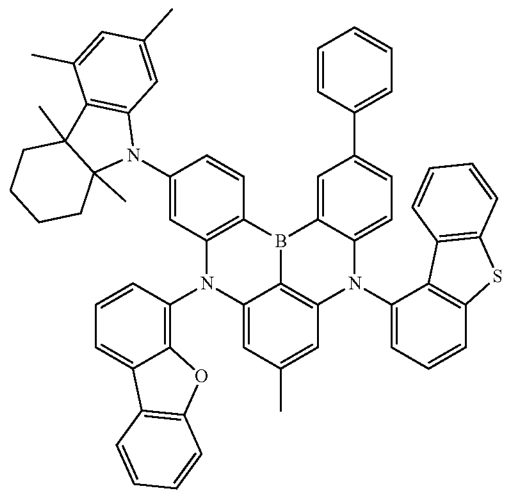
-continued
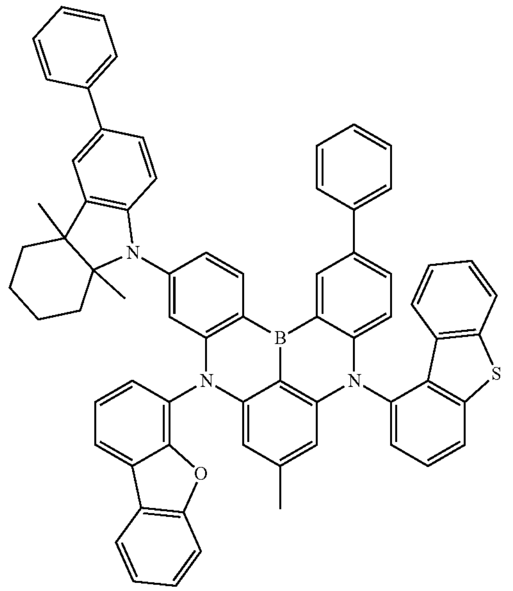
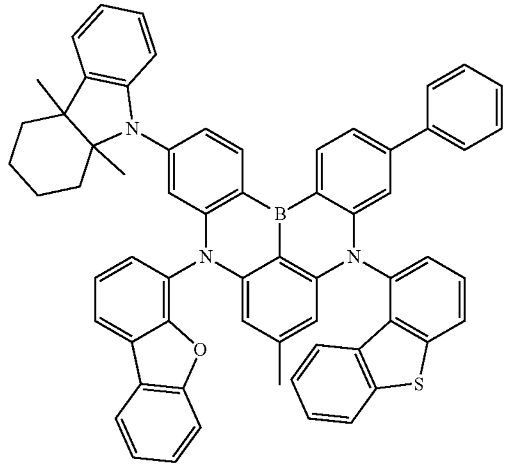
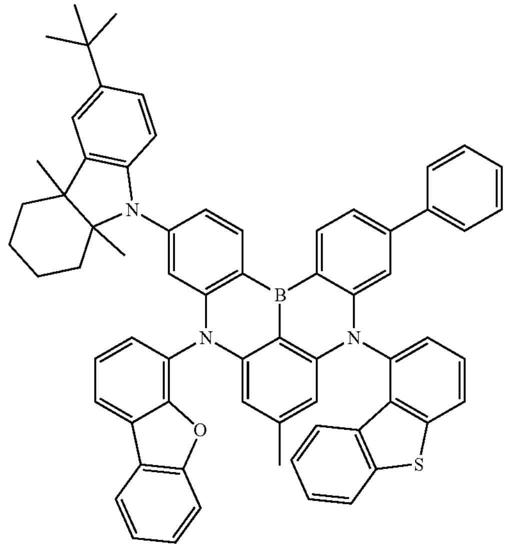

-continued
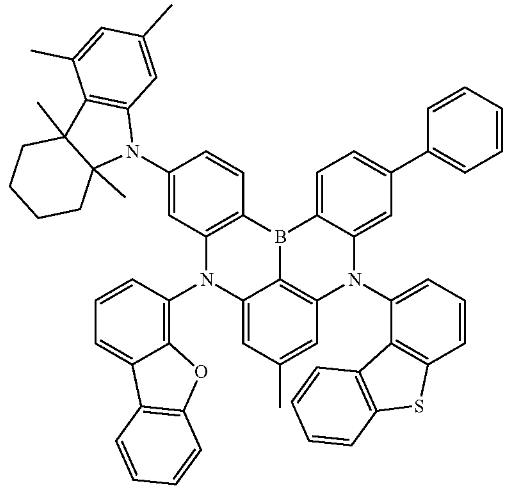
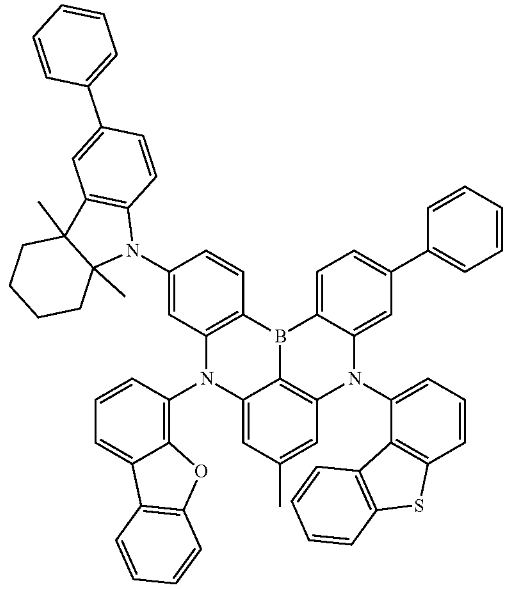
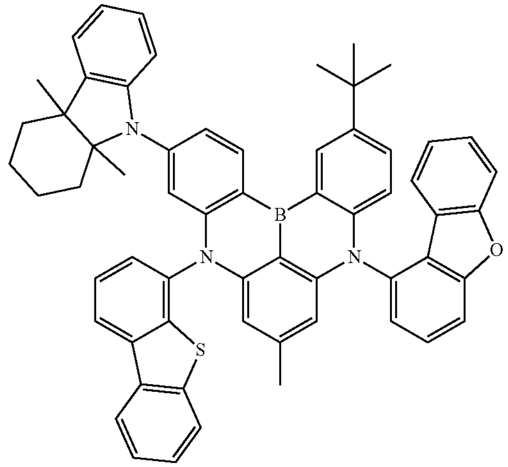
-continued
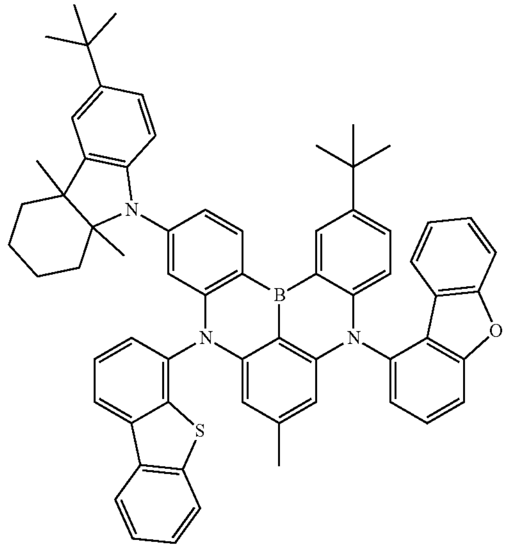
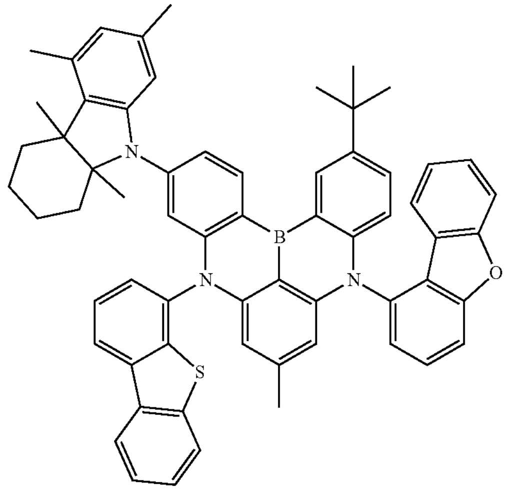
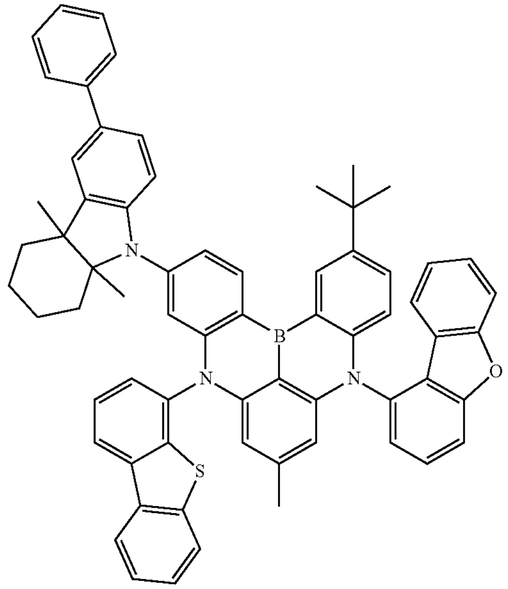

-continued
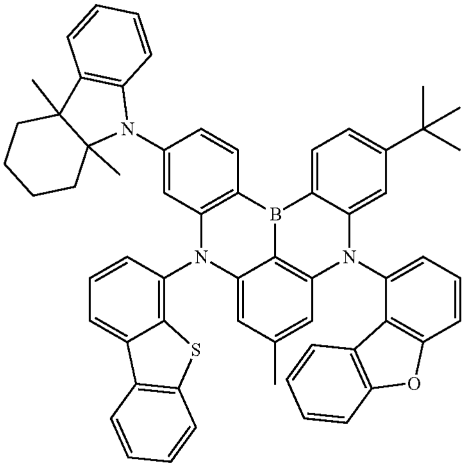
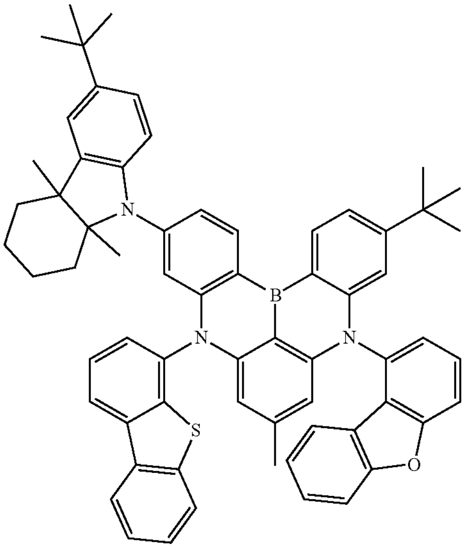
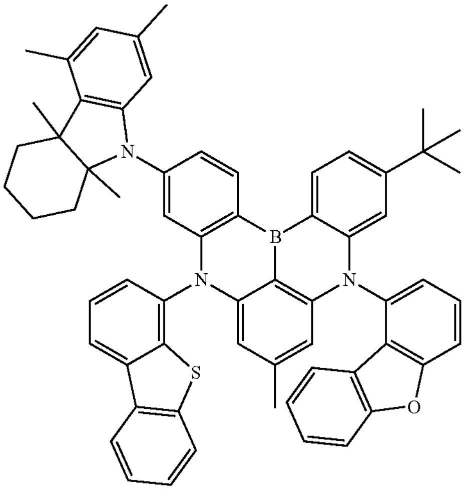
-continued
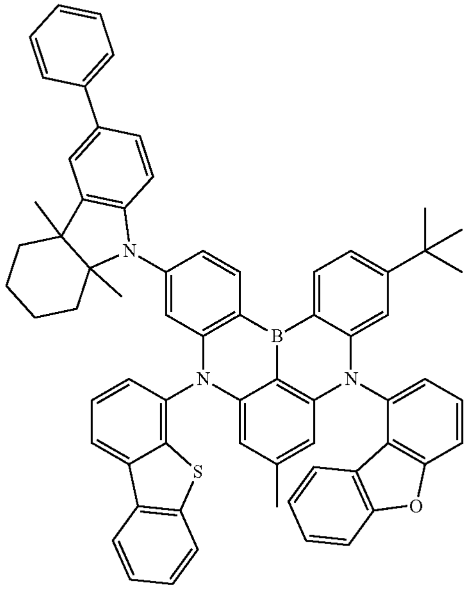
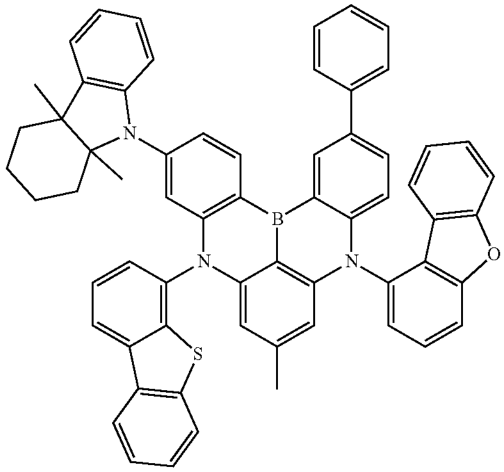
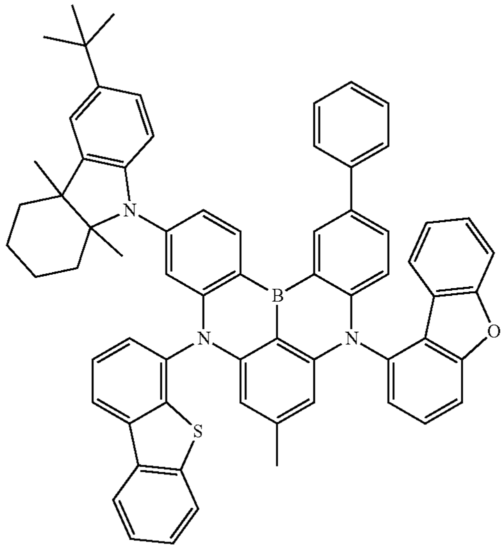

-continued
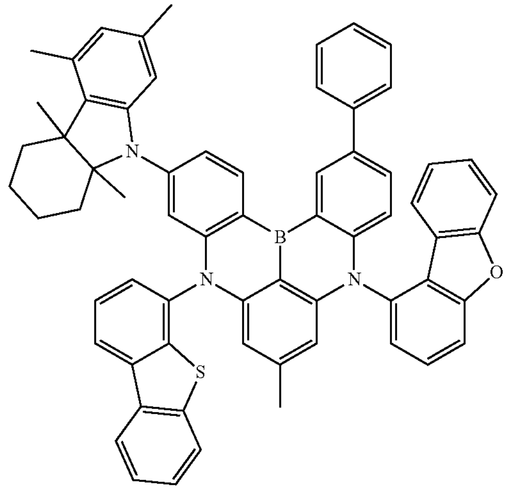
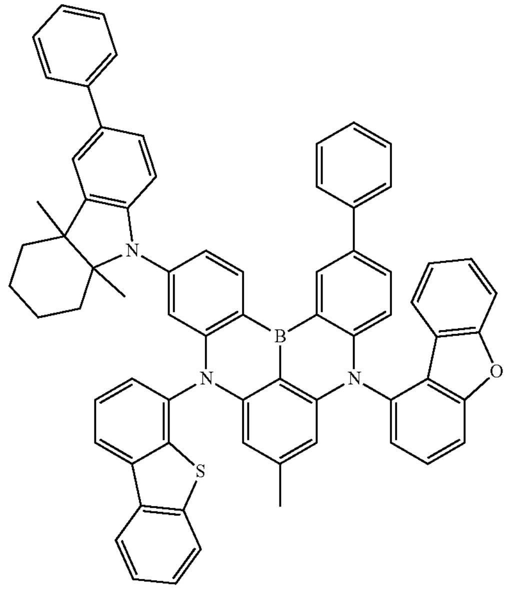
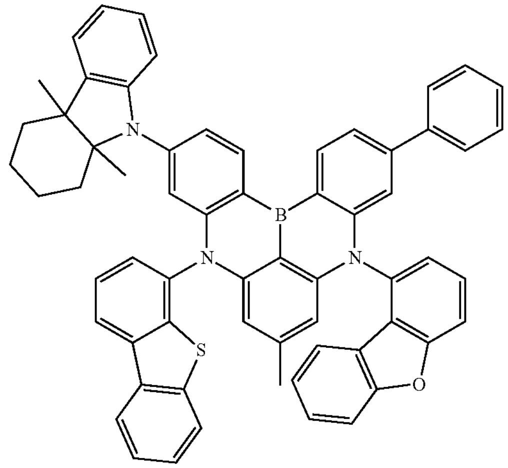
-continued
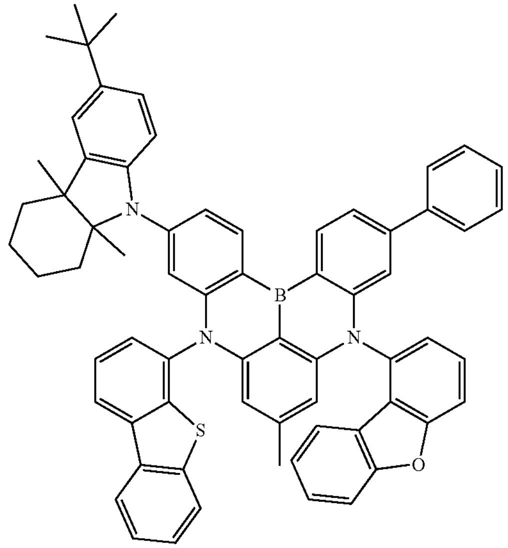
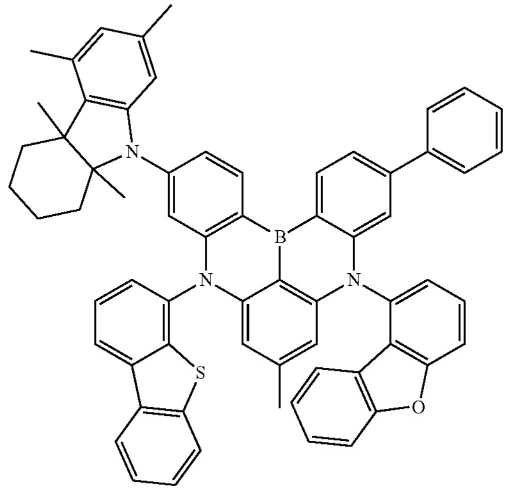
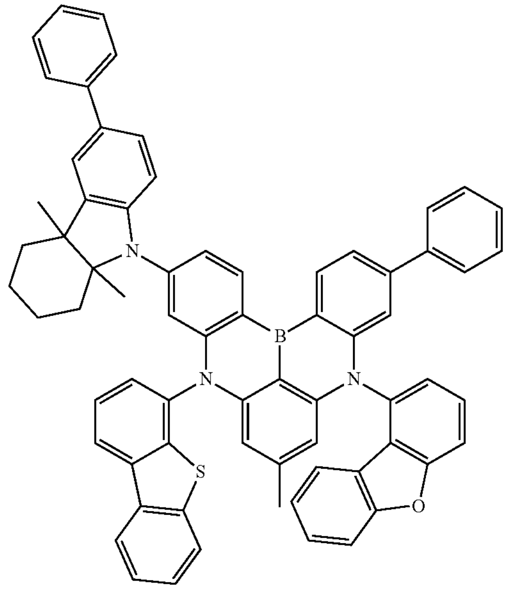

-continued
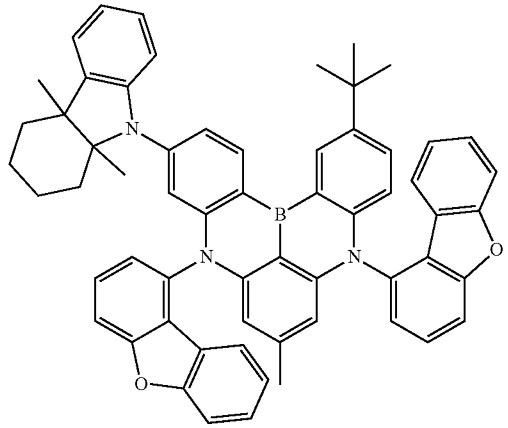
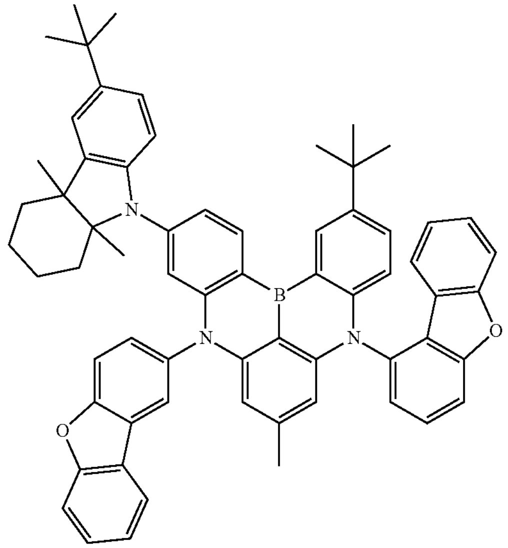
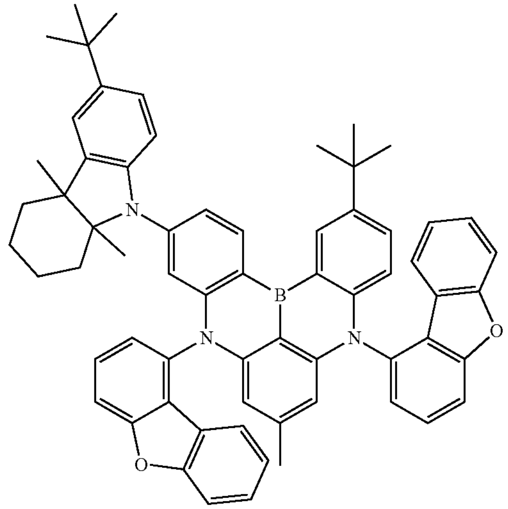
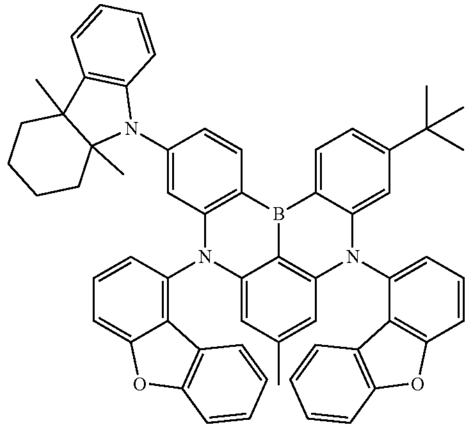
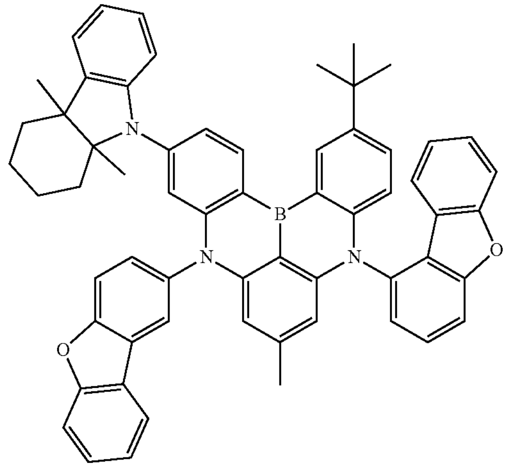
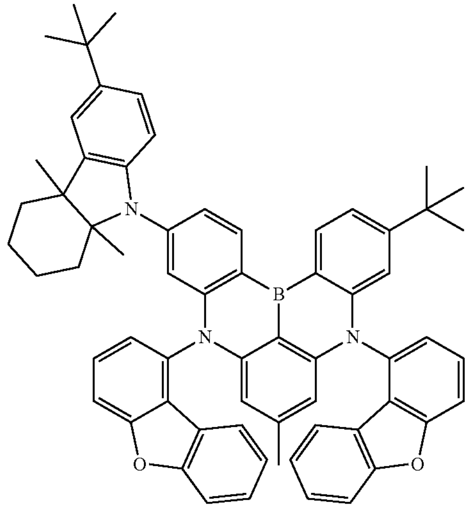
-continued -continued
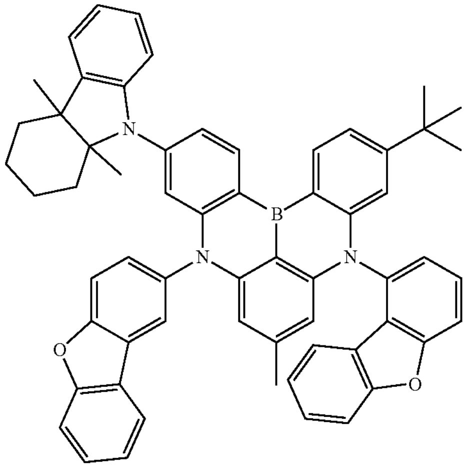
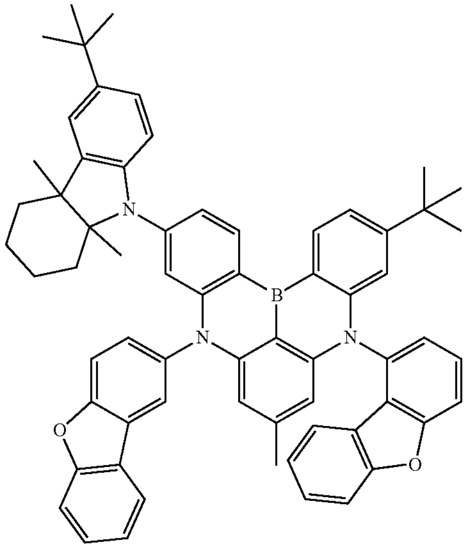
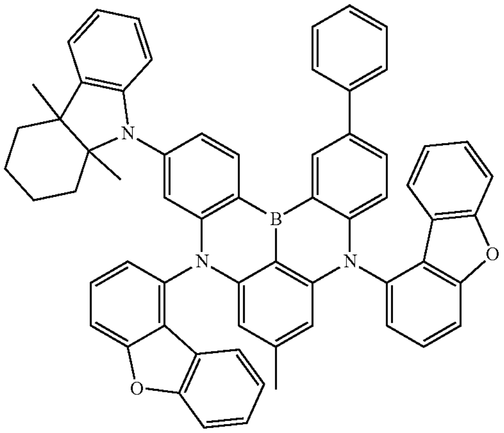
-continued
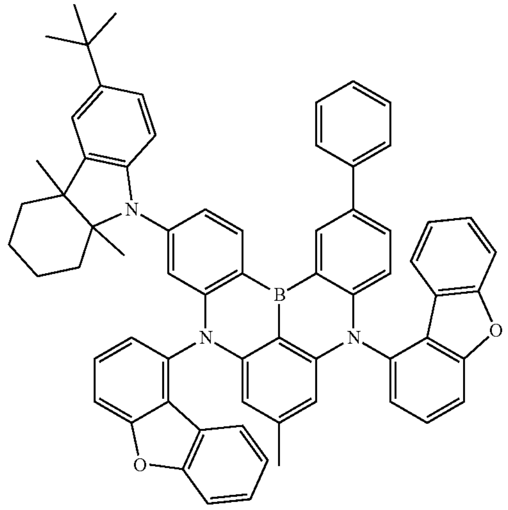
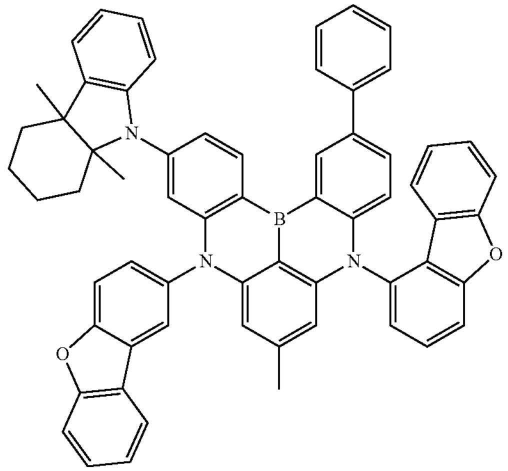
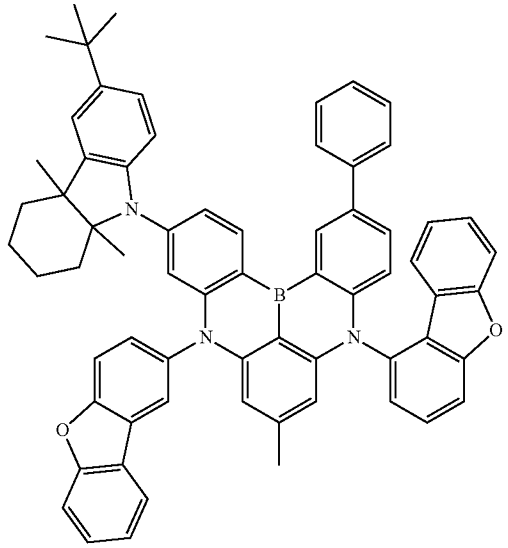

-continued
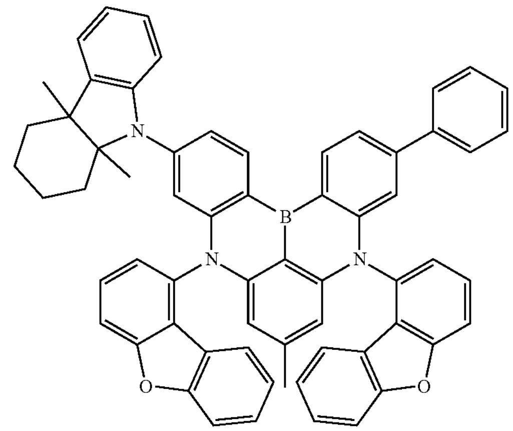
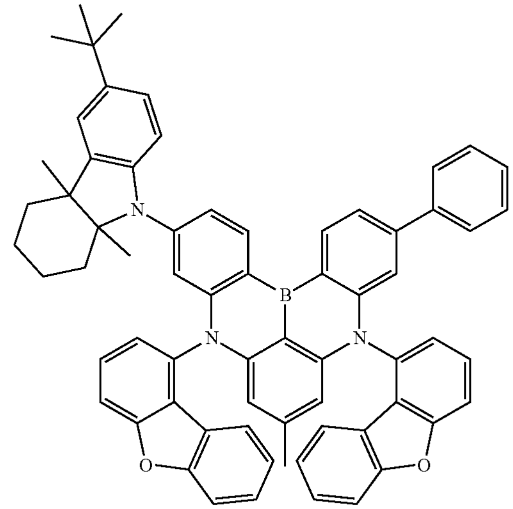
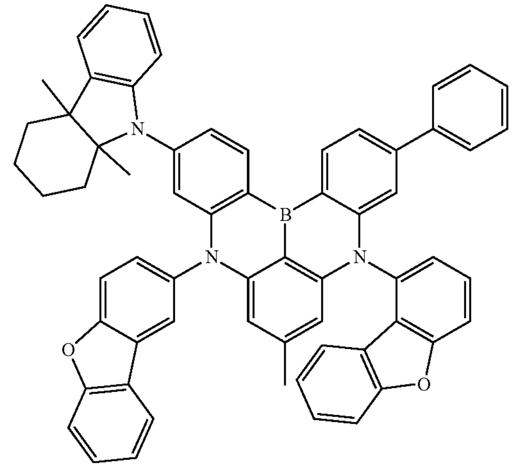
-continued
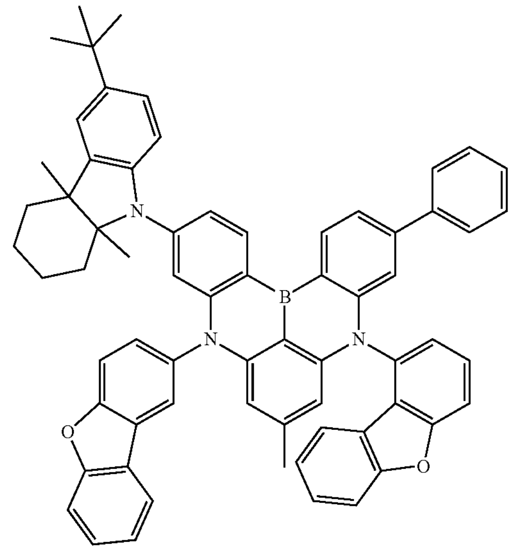
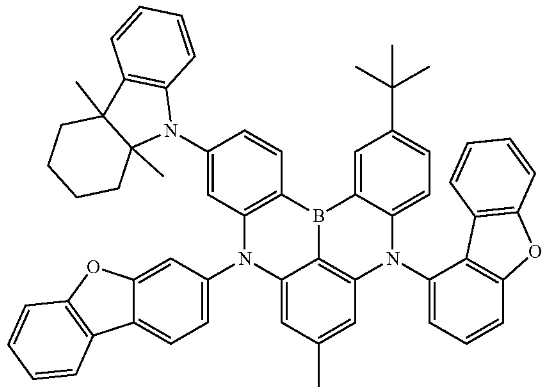
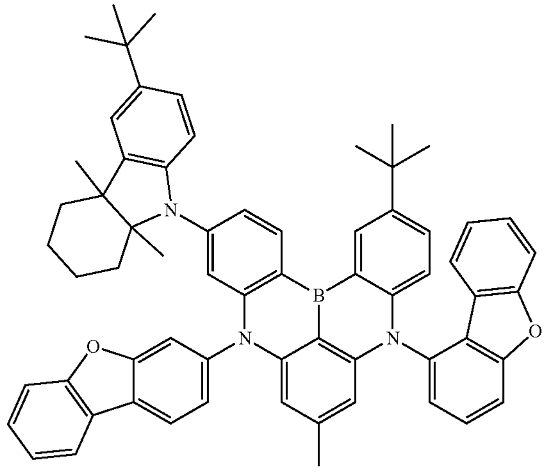

-continued
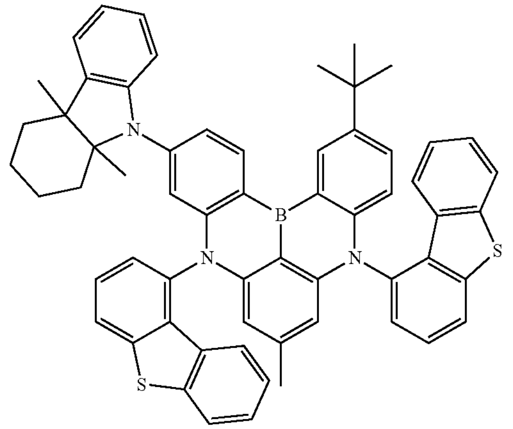
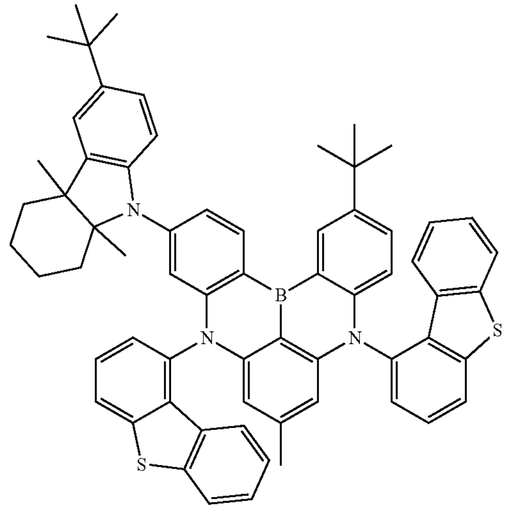
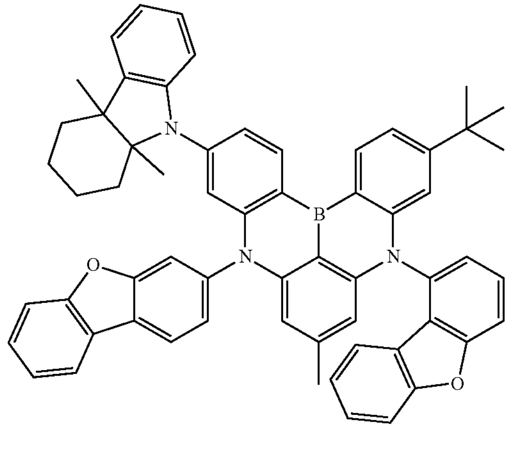
-continued
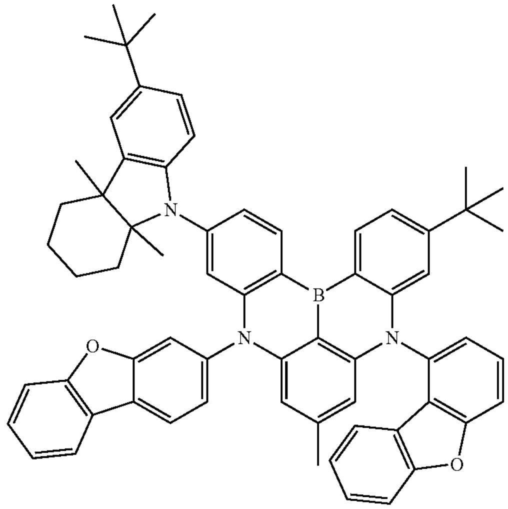
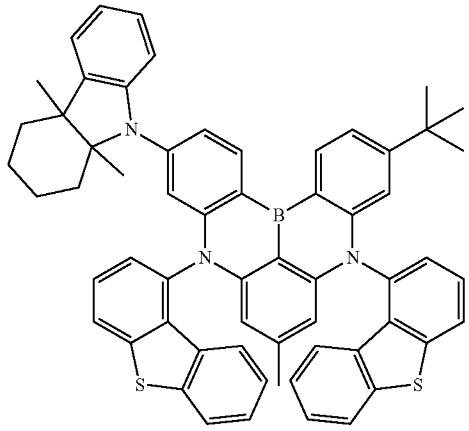
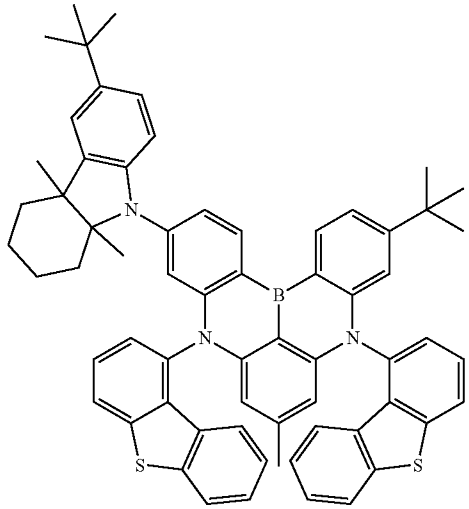

-continued
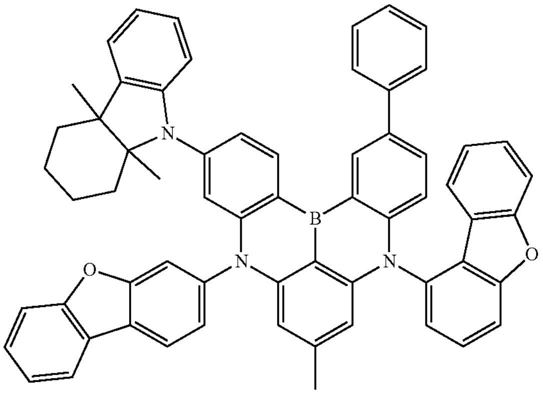
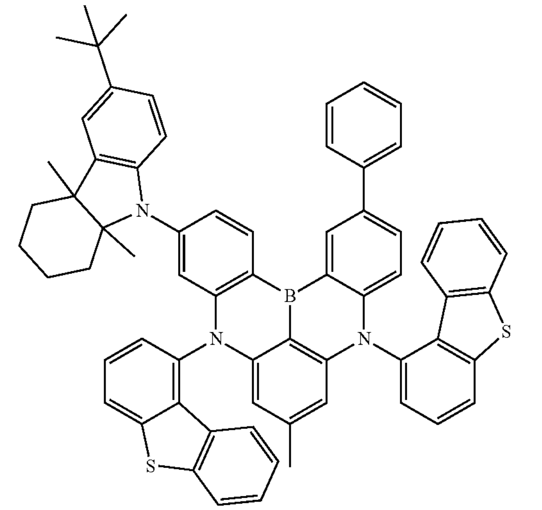
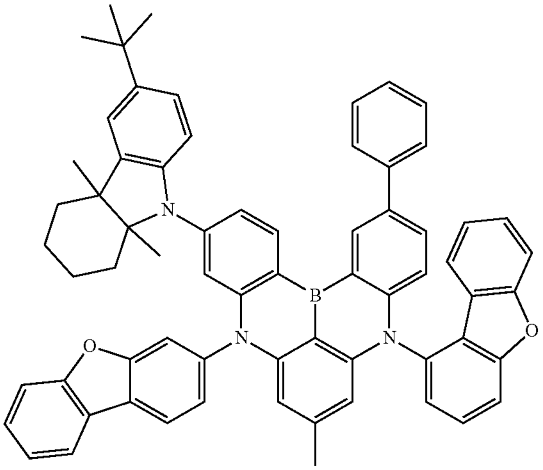
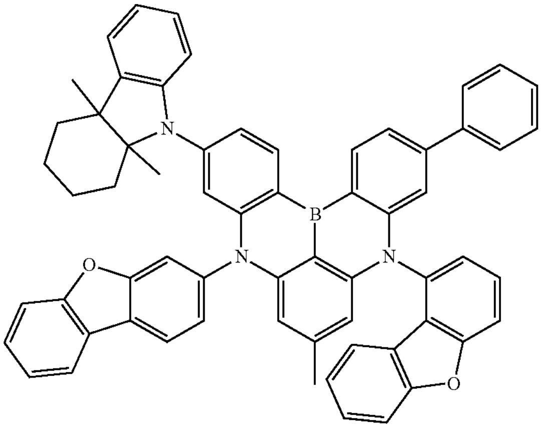
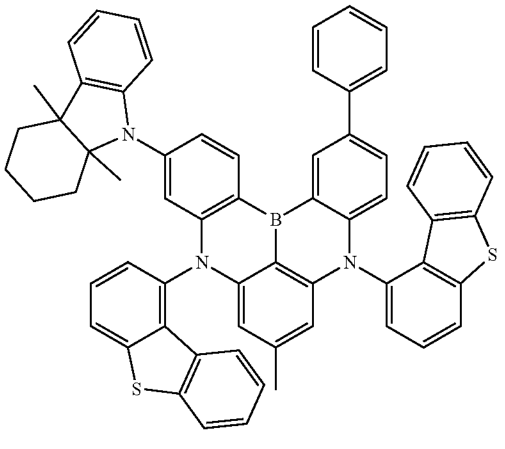
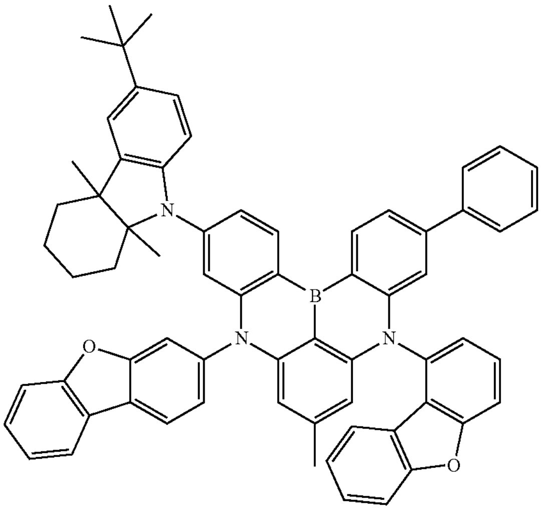
-continued -continued
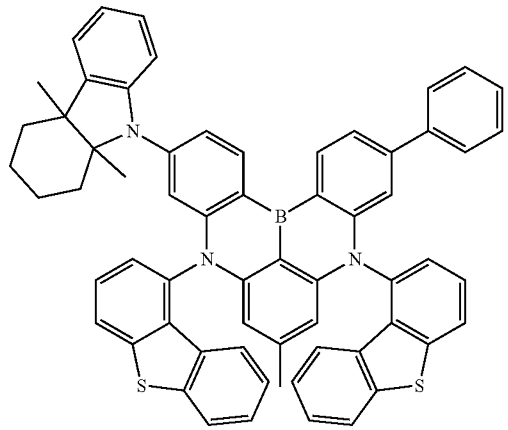
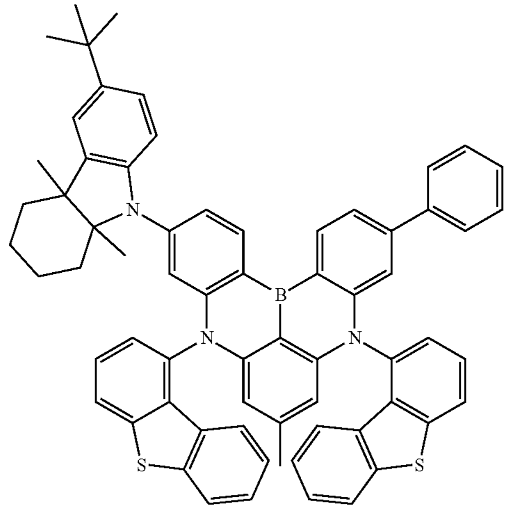 [SMILES: Cc1cc2c3c(c1)N(c1cccc4sc5ccccc5c14)c1cc(N4c5ccc(C(C)(C)C)cc5C5(C)CCCCC45C)ccc1B3c1ccc(-c3ccccc3)cc1N2c1cccc2sc3ccccc3c12]
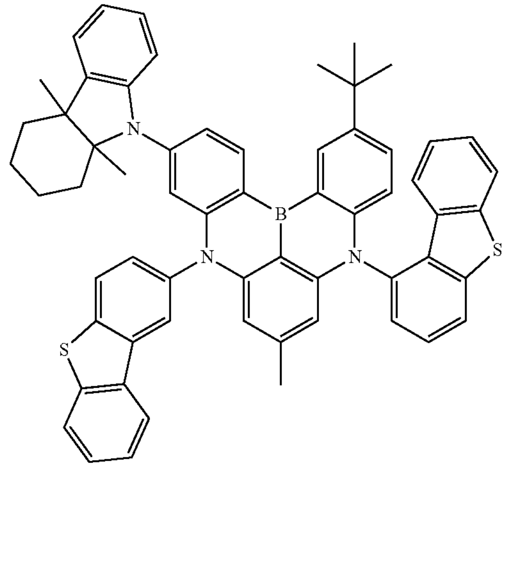
-continued
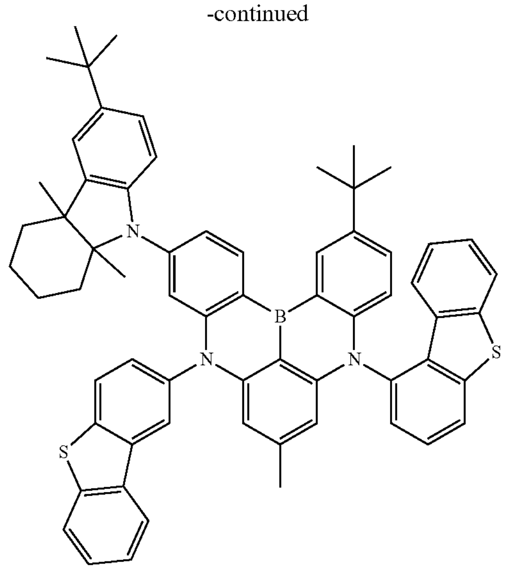
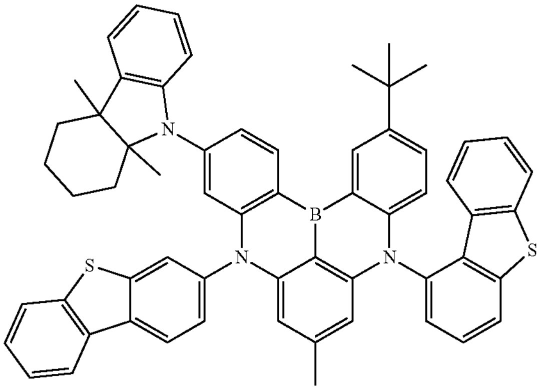
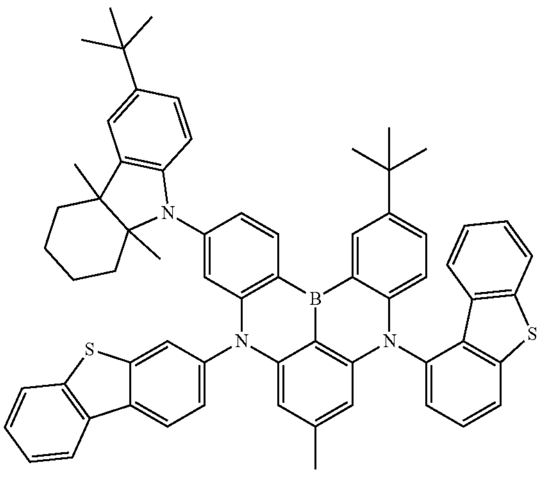

-continued
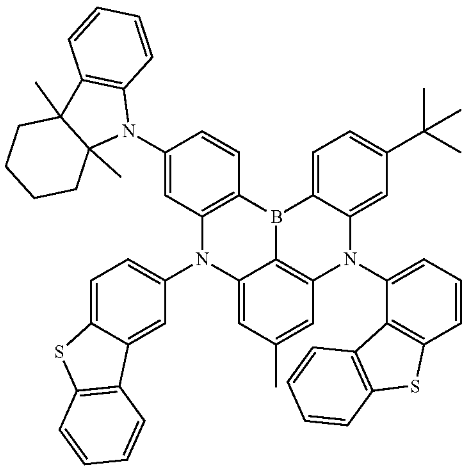
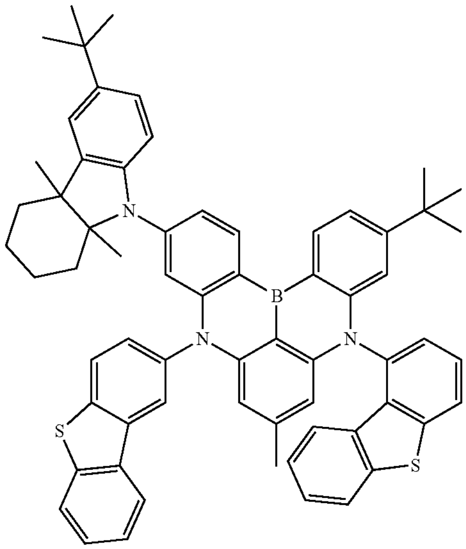
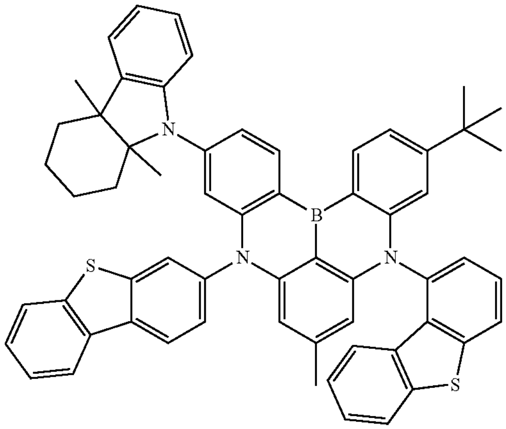
-continued
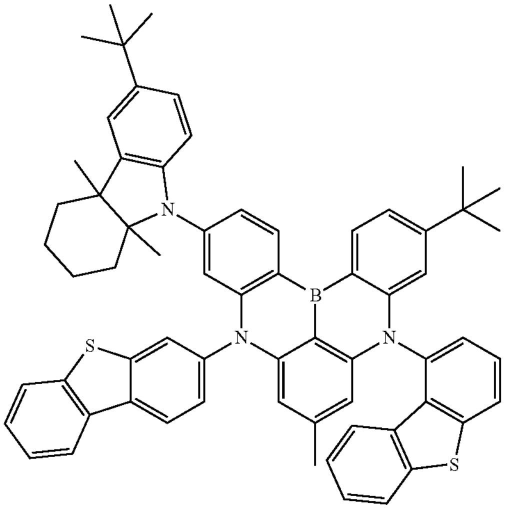
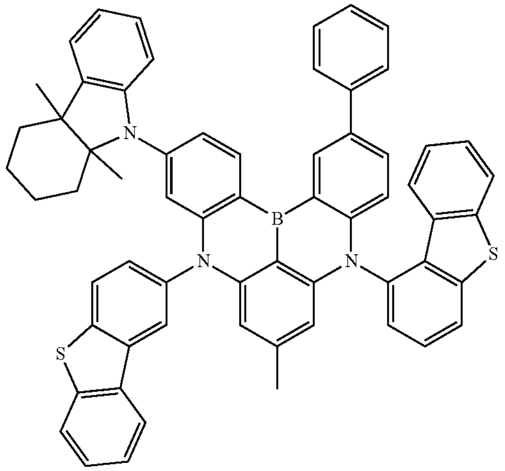
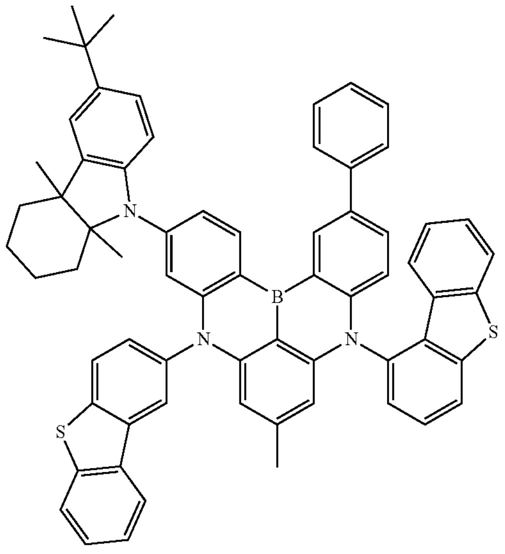

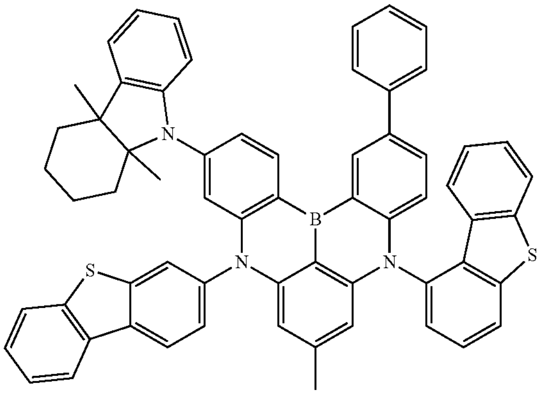
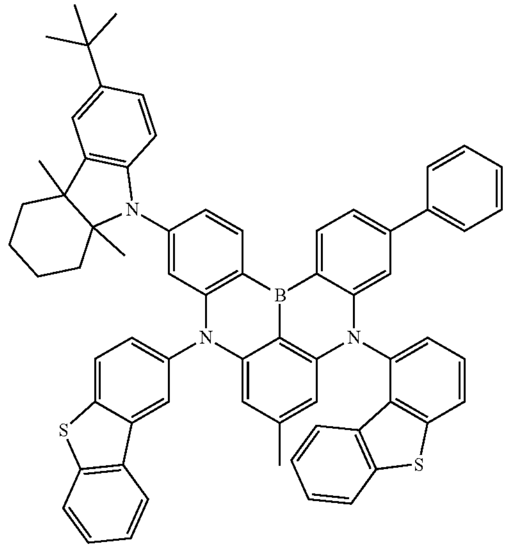
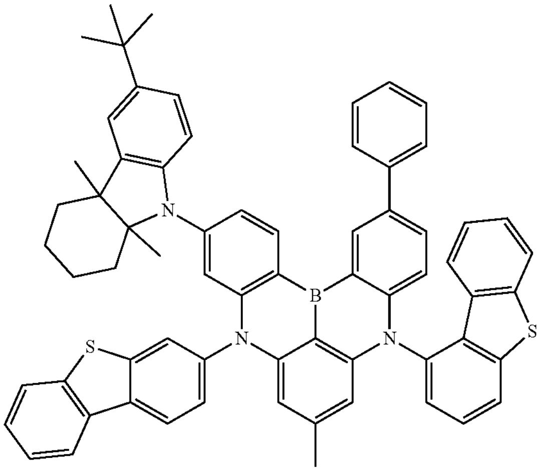
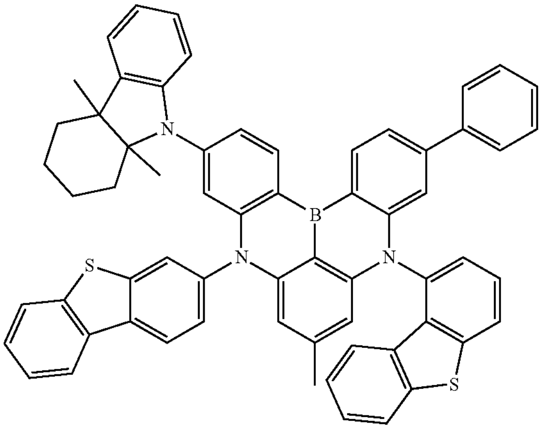
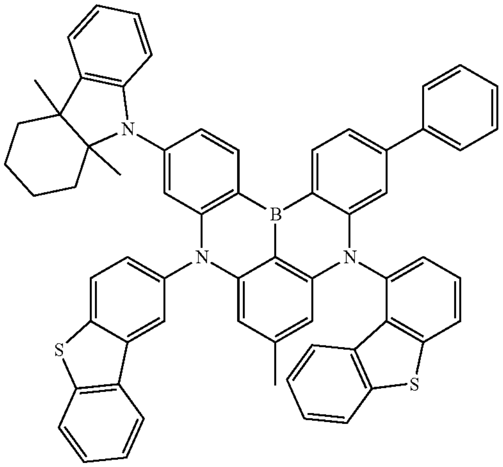
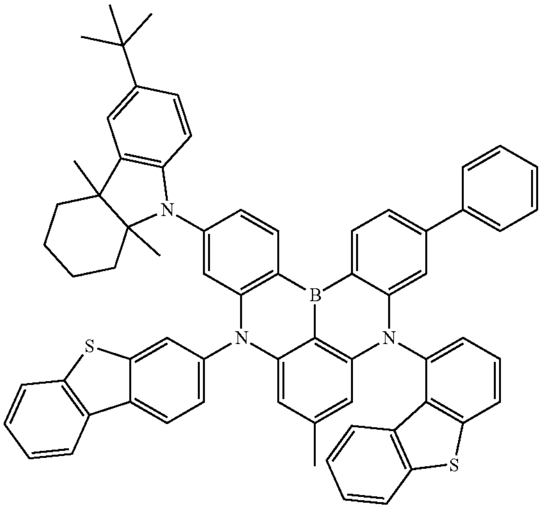

-continued
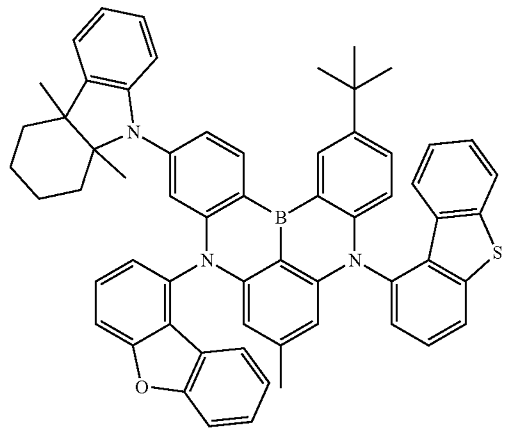
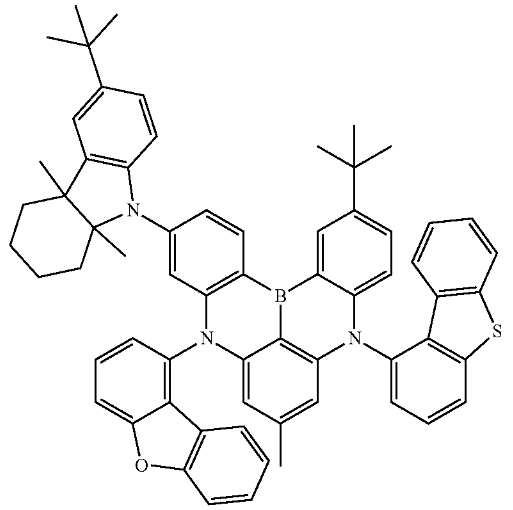
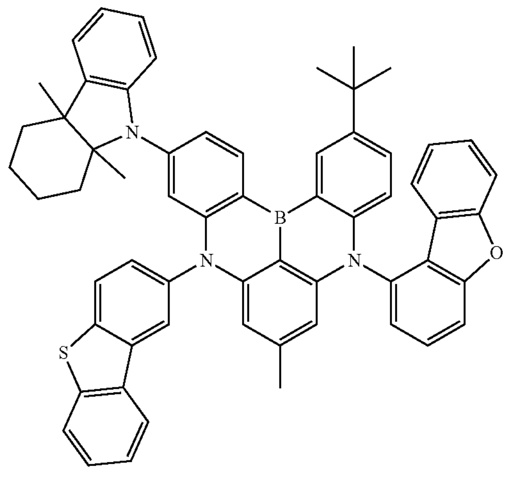
-continued
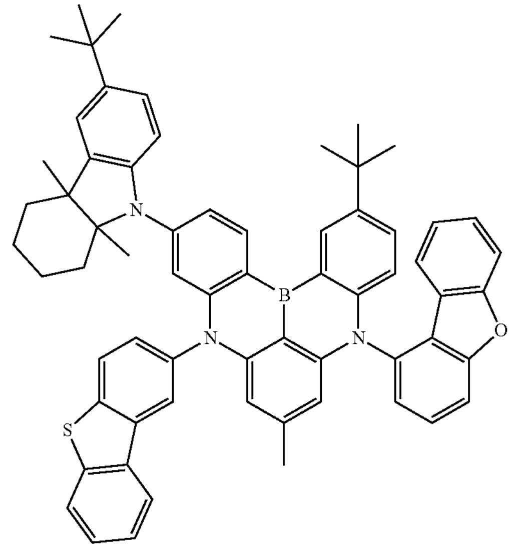
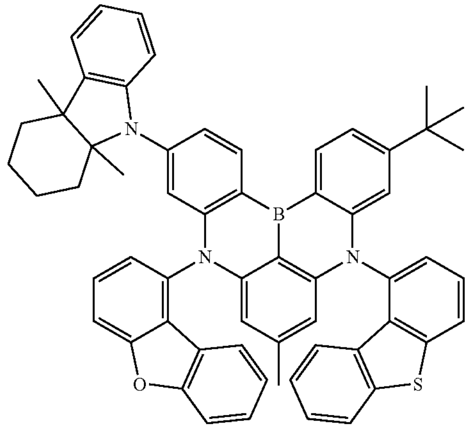
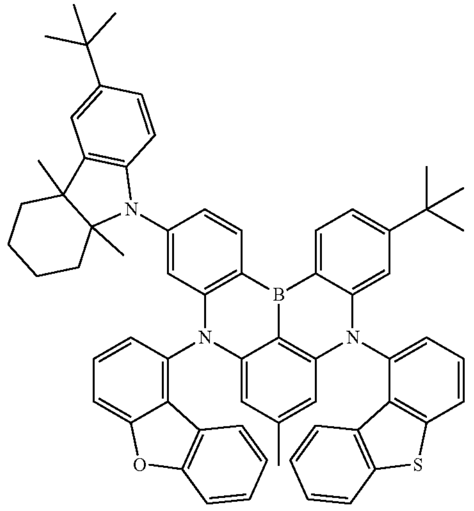

-continued
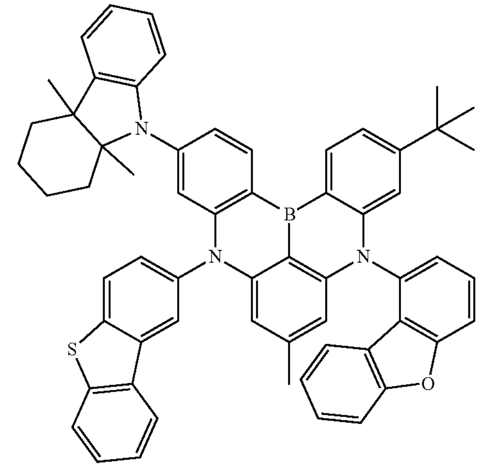
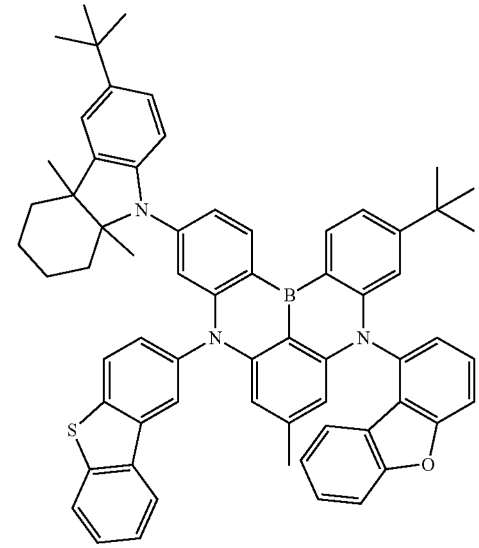
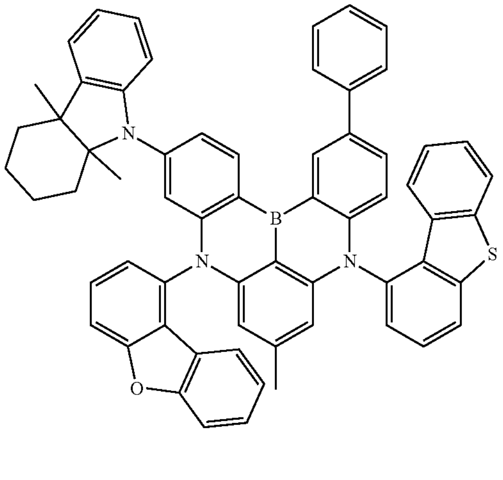
-continued
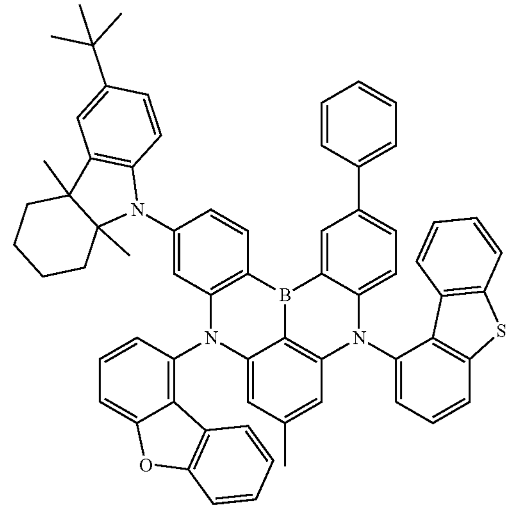
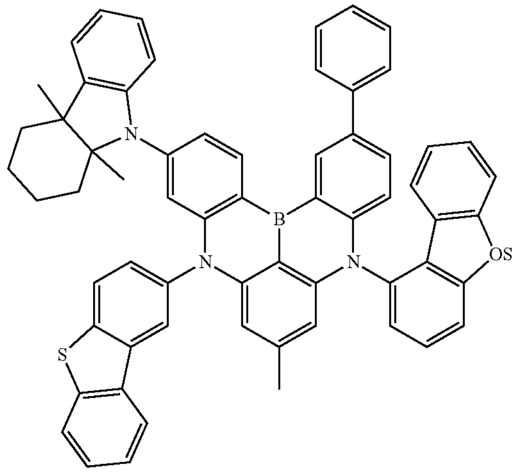
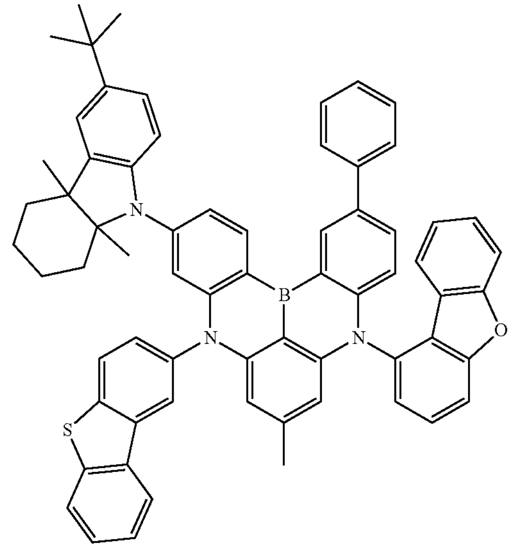

-continued
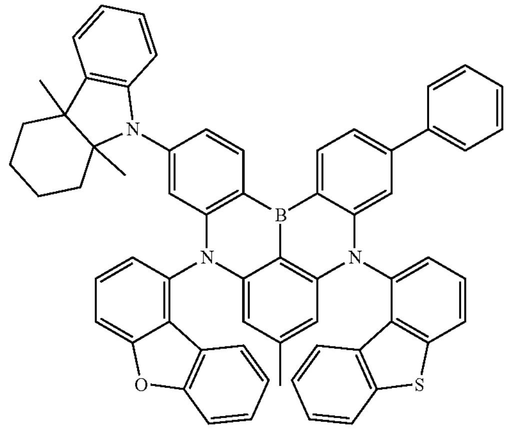
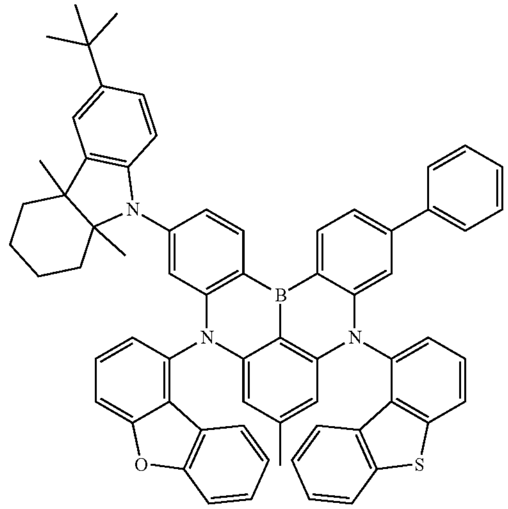
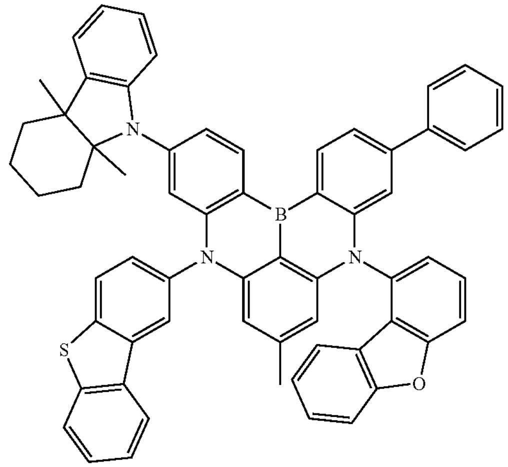
-continued
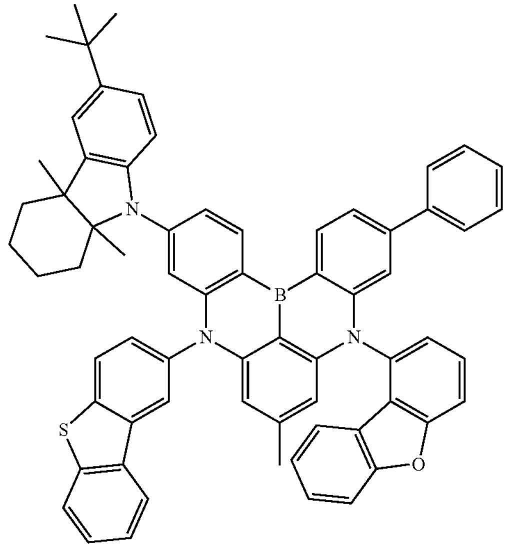
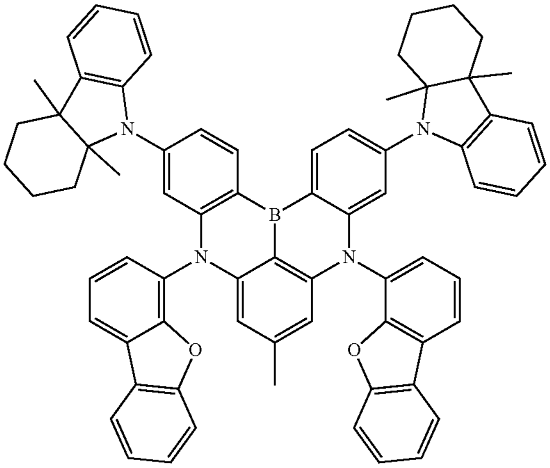
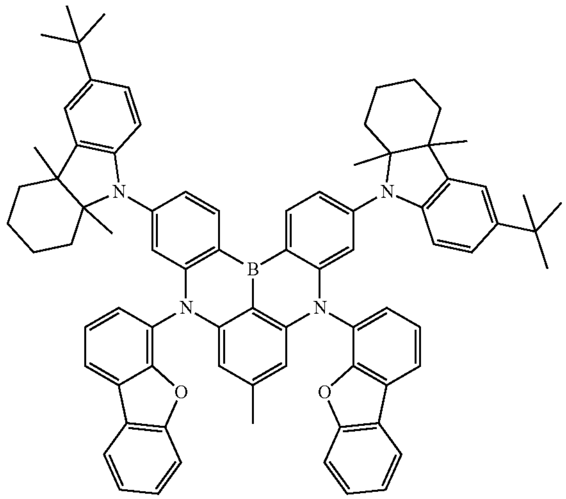

-continued
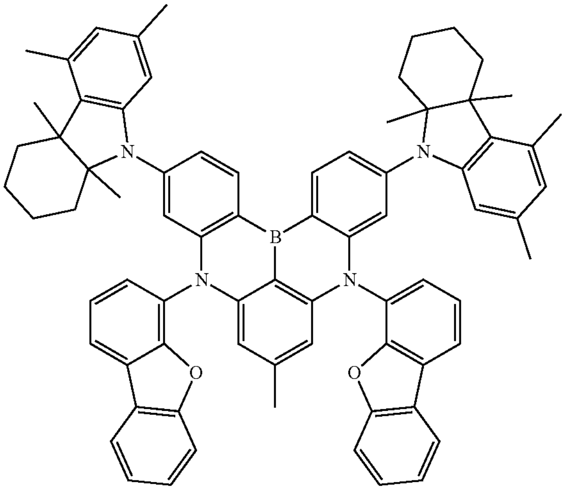
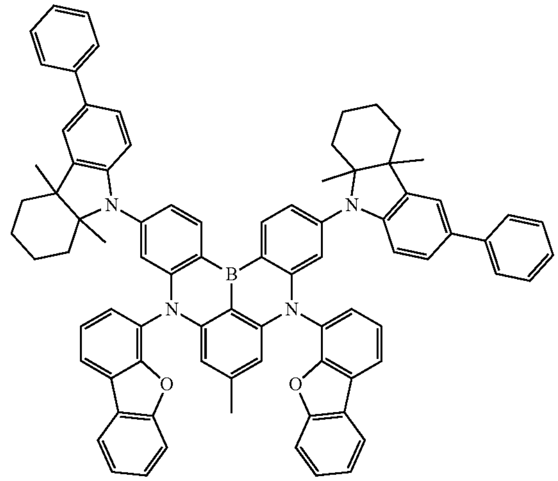
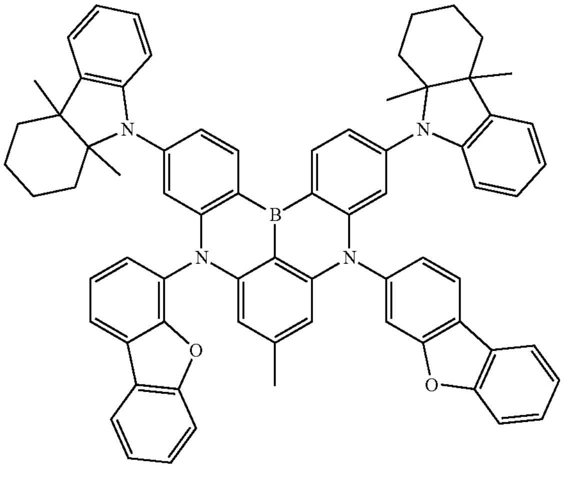
-continued
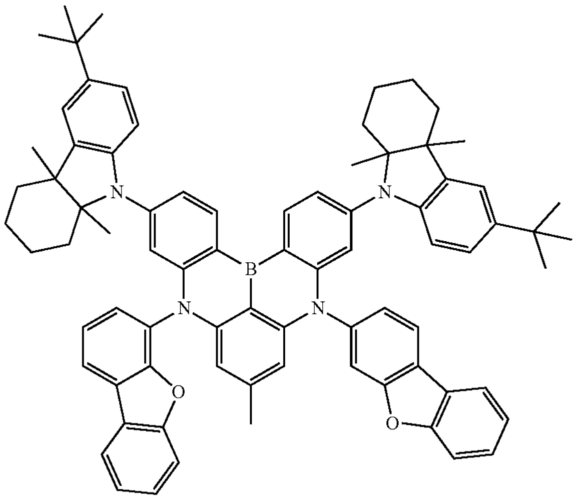
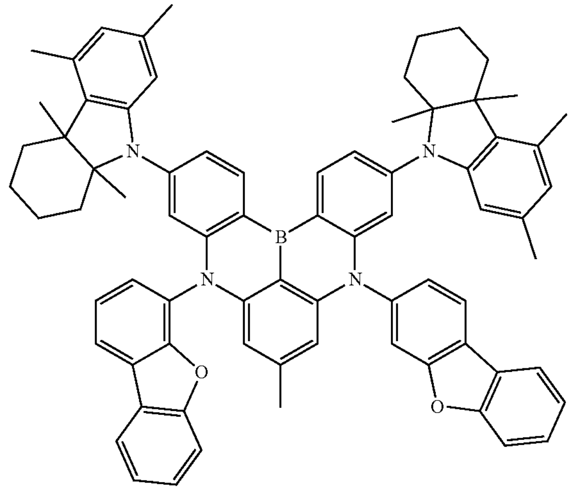
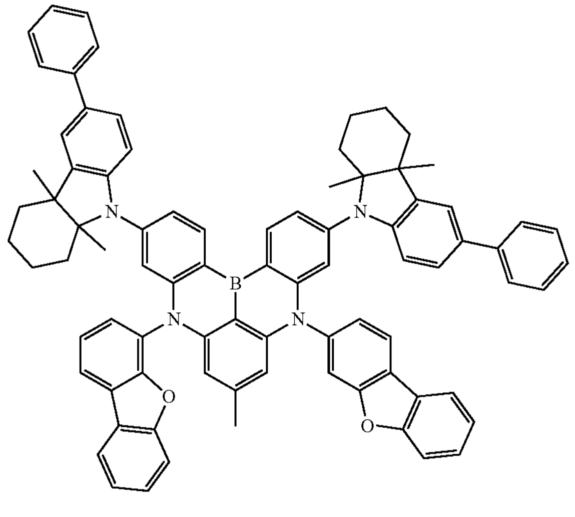

-continued
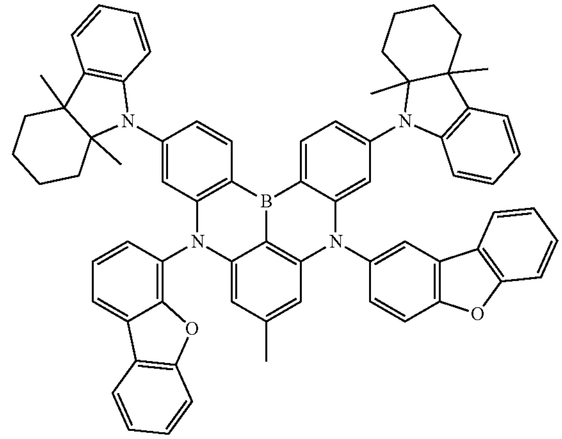
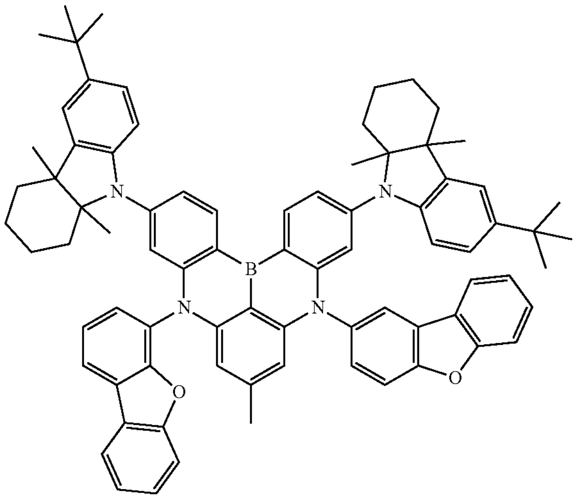
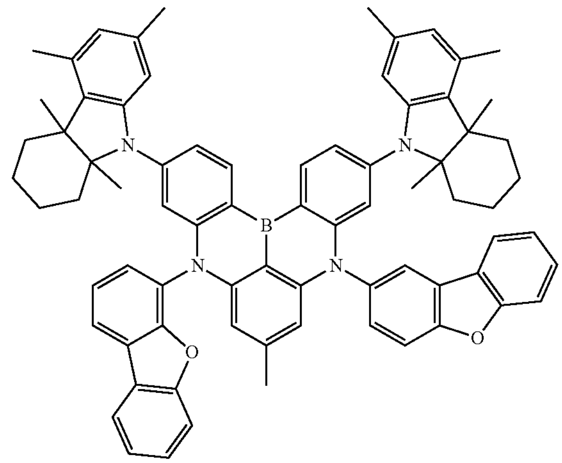
-continued
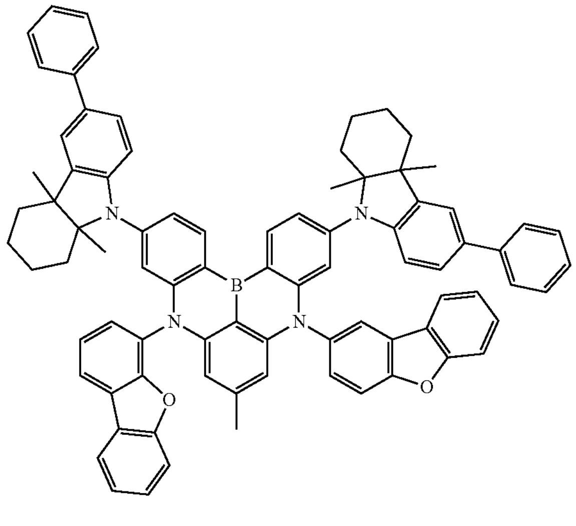
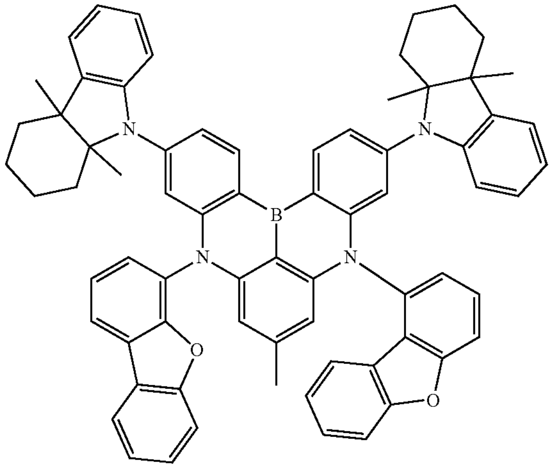
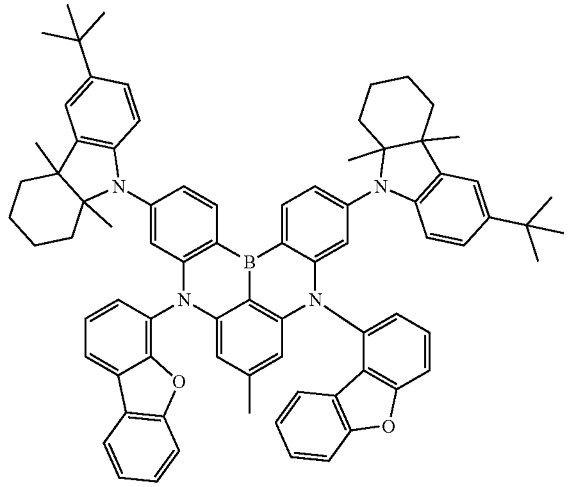

-continued
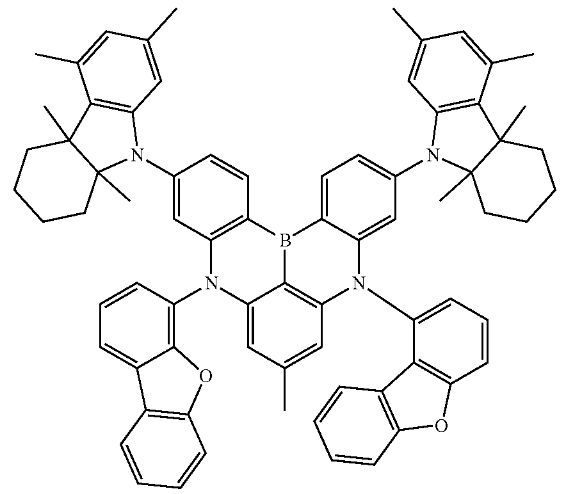
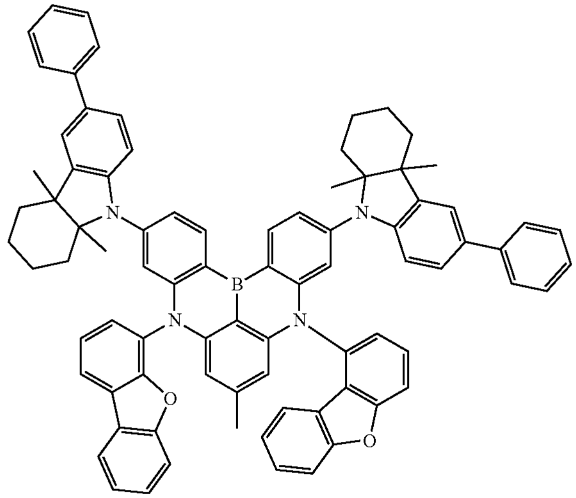
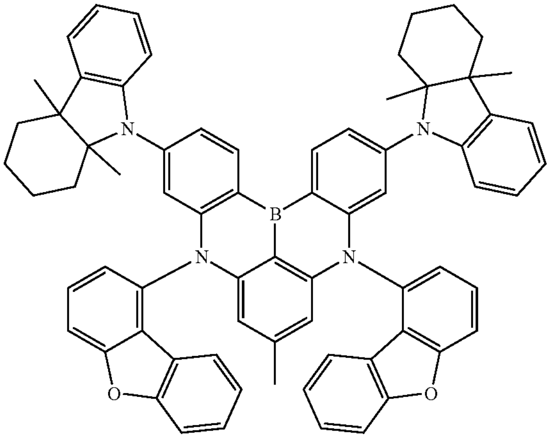
-continued
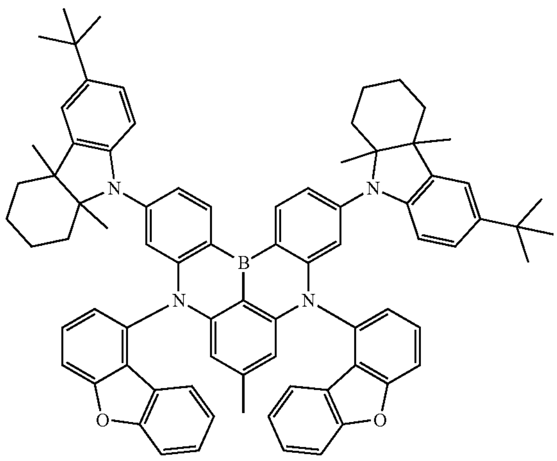
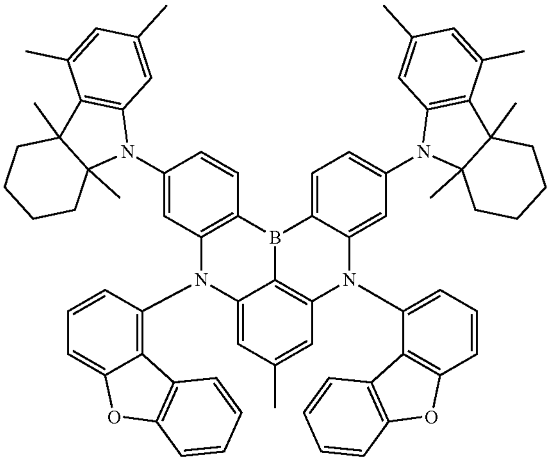
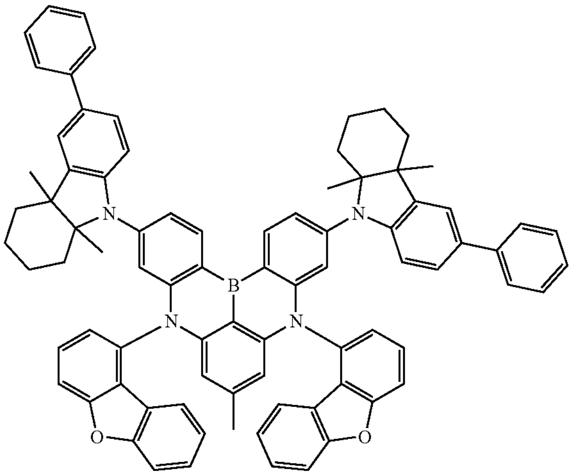

-continued
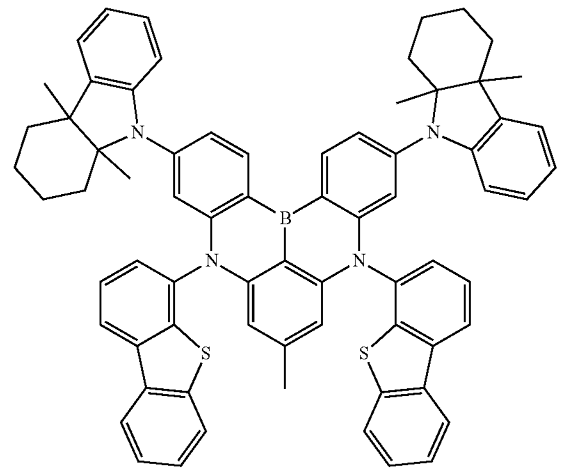
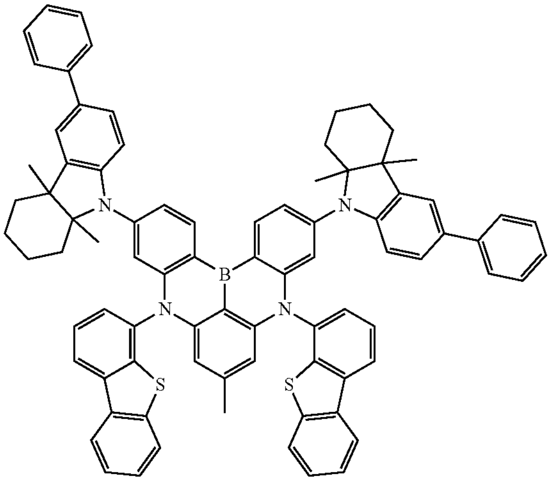
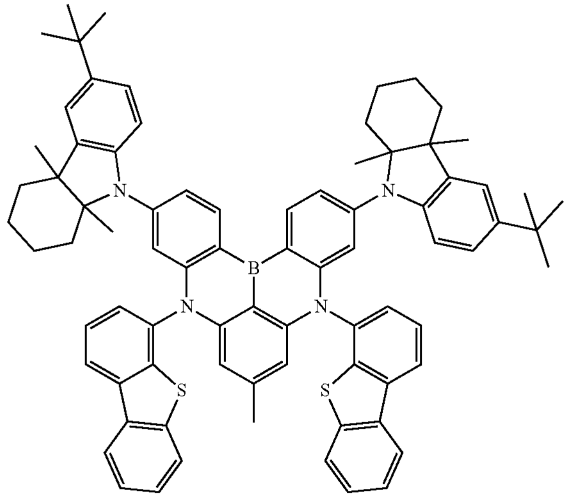
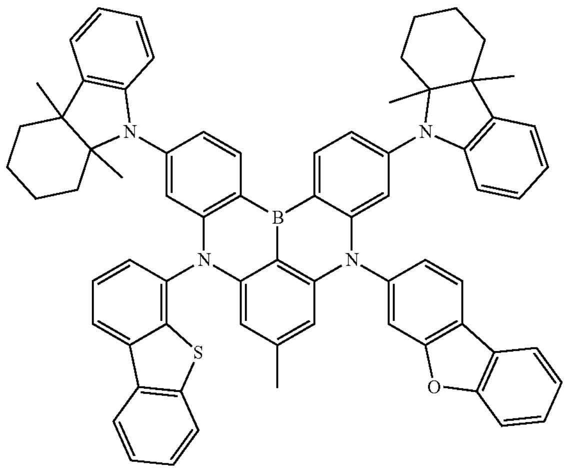
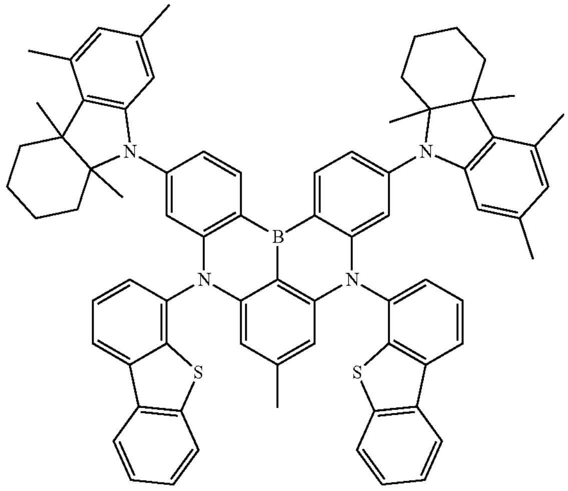
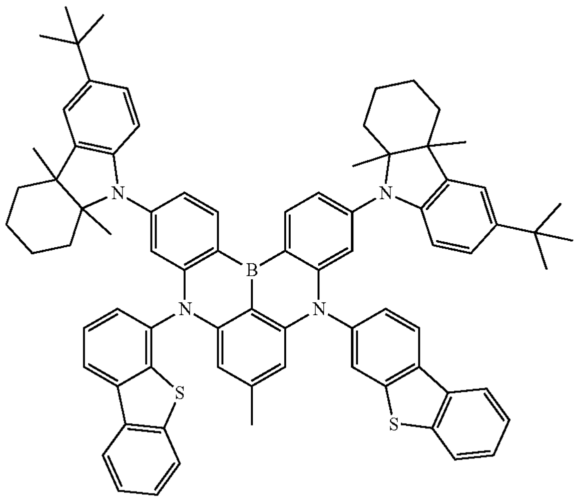
-continued -continued
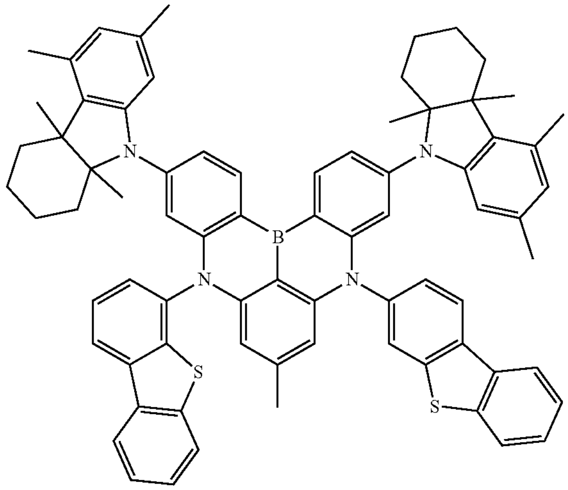
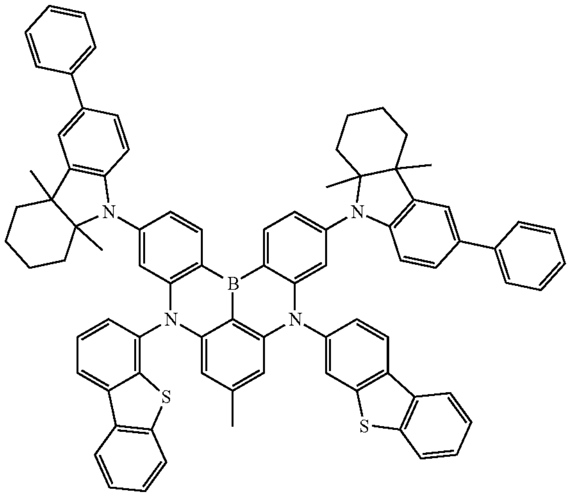
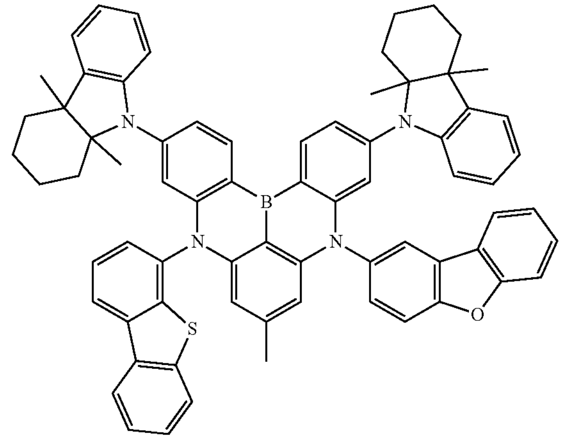
-continued
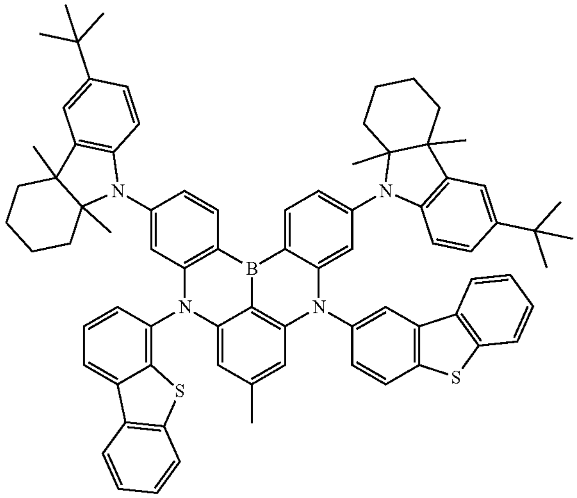
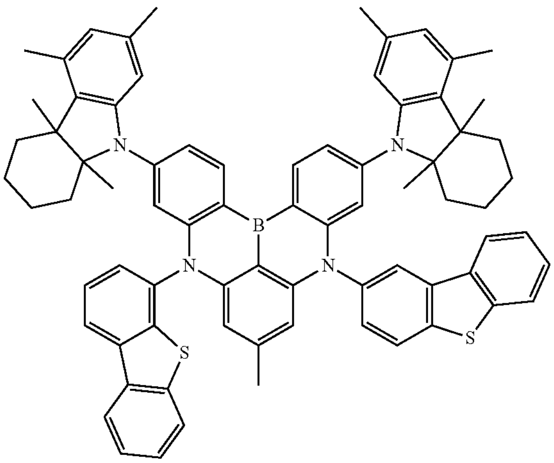
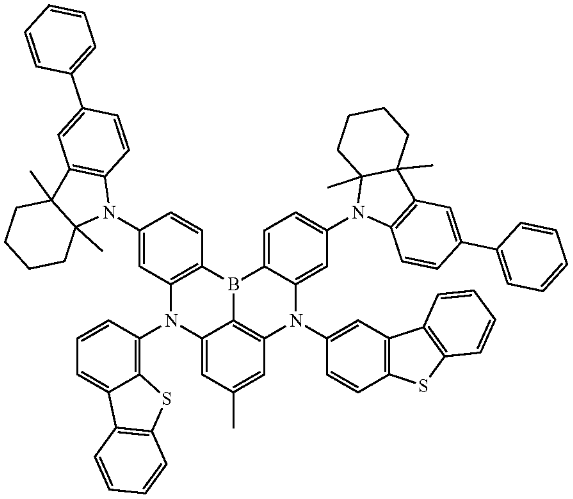

-continued
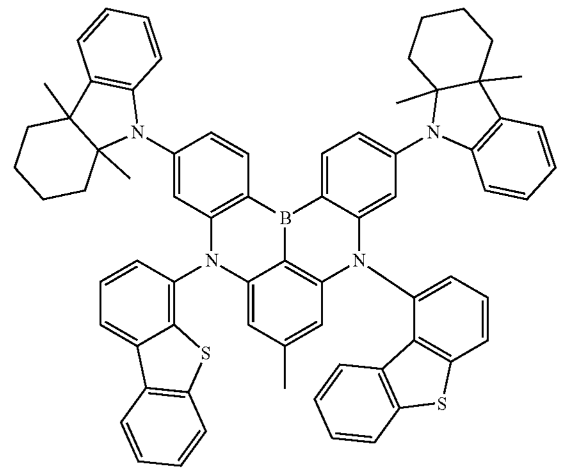
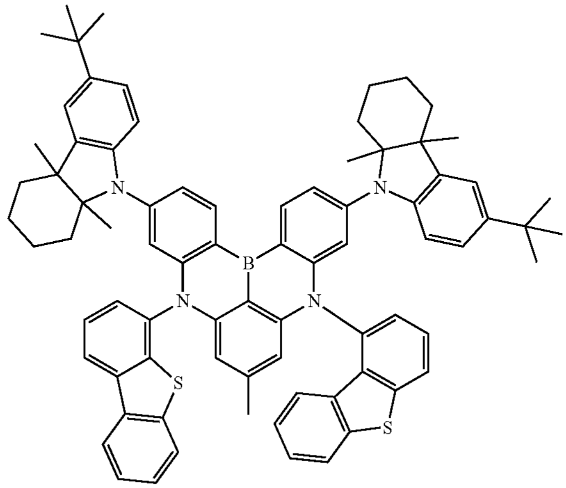
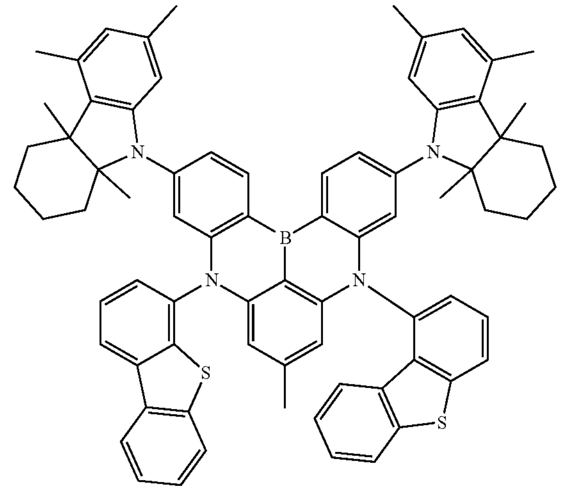
-continued
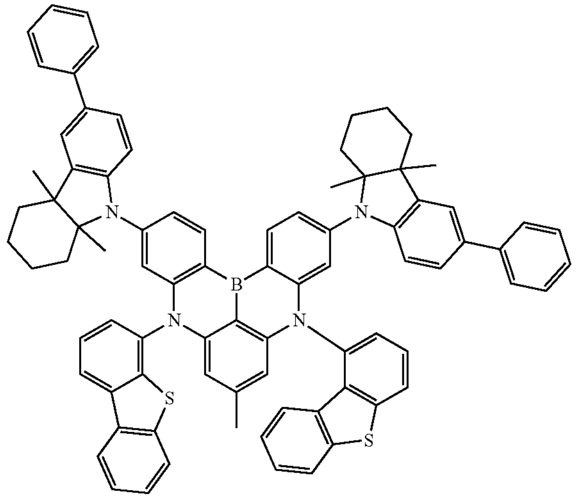
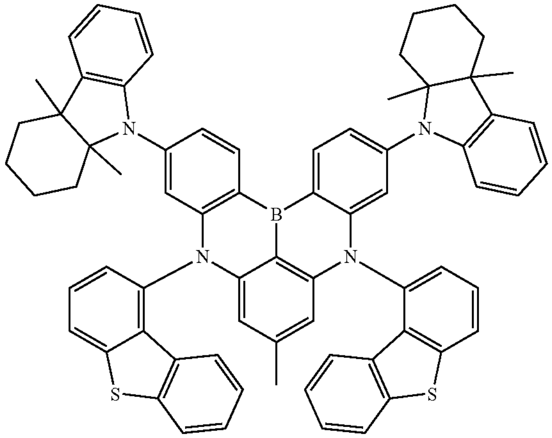
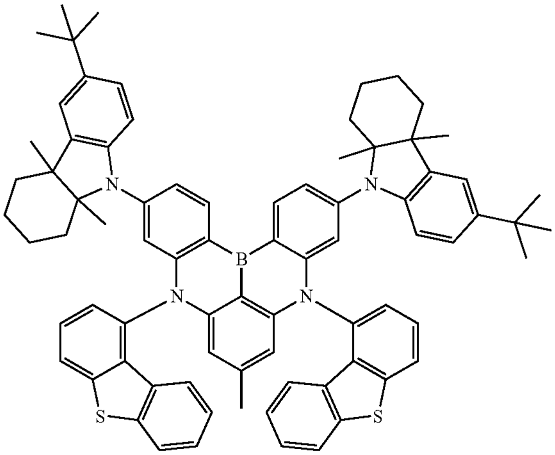

-continued
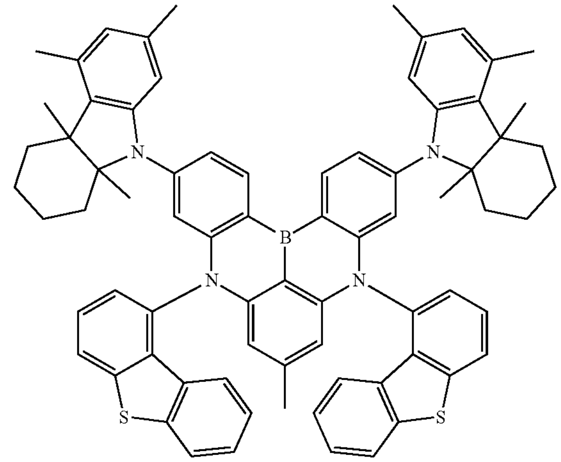
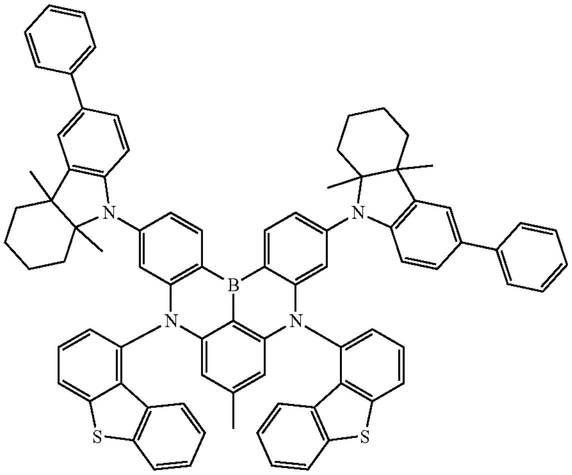
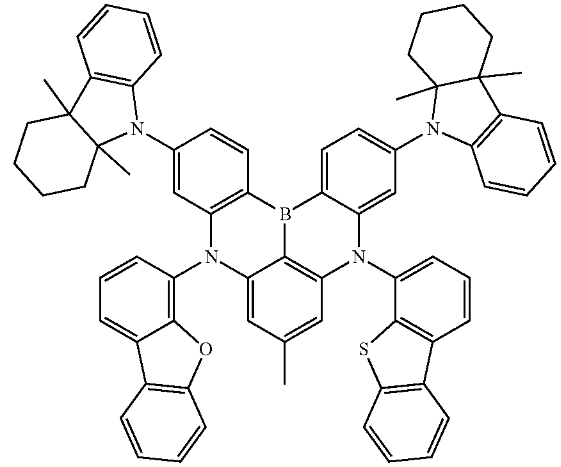
-continued
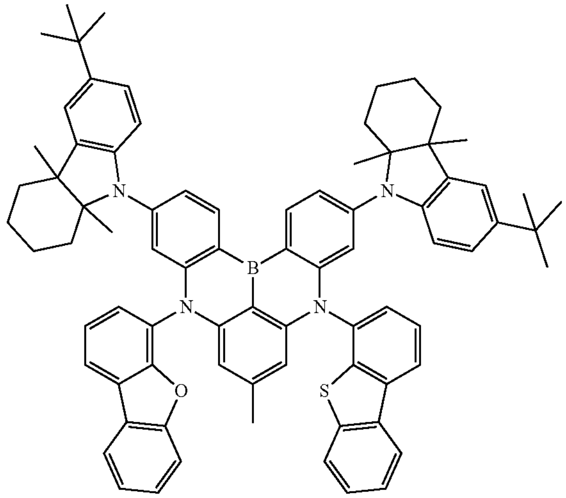
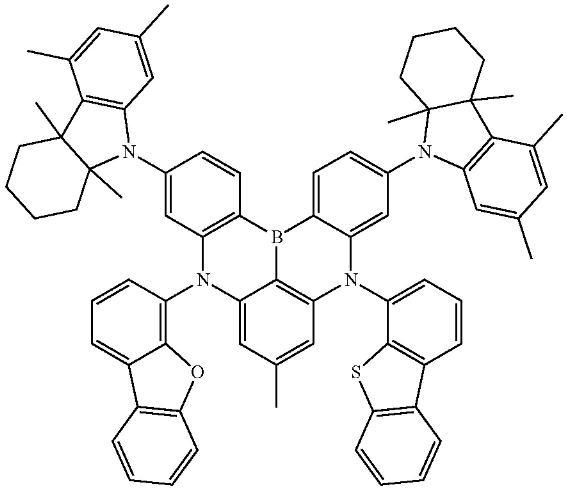
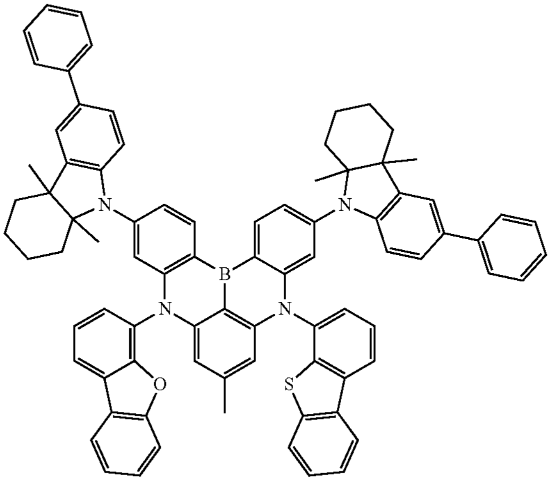

-continued
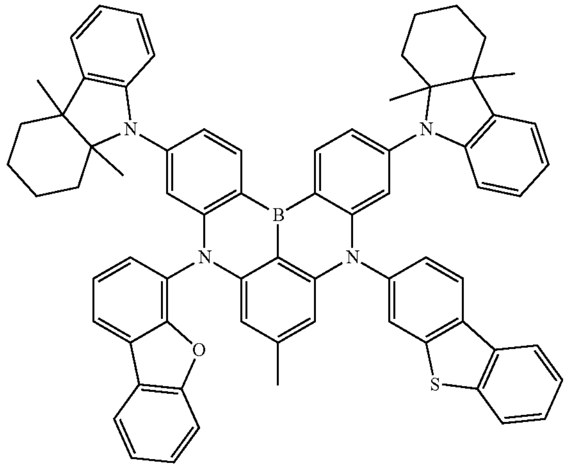
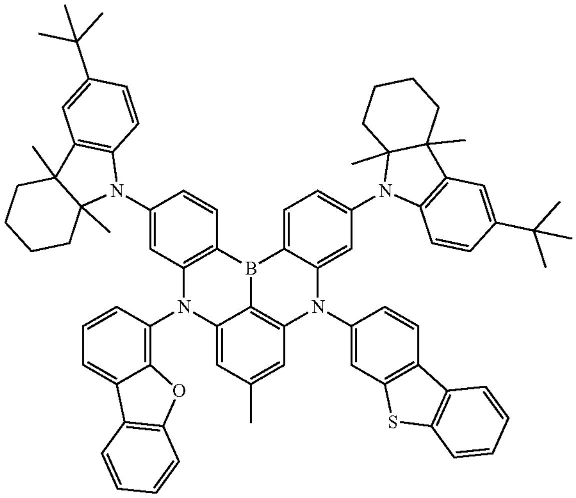
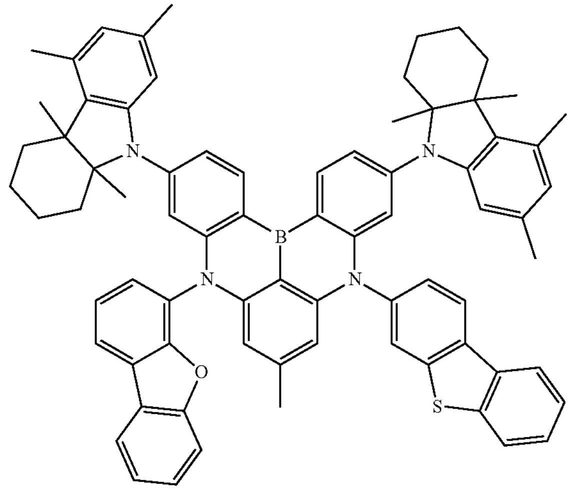
-continued
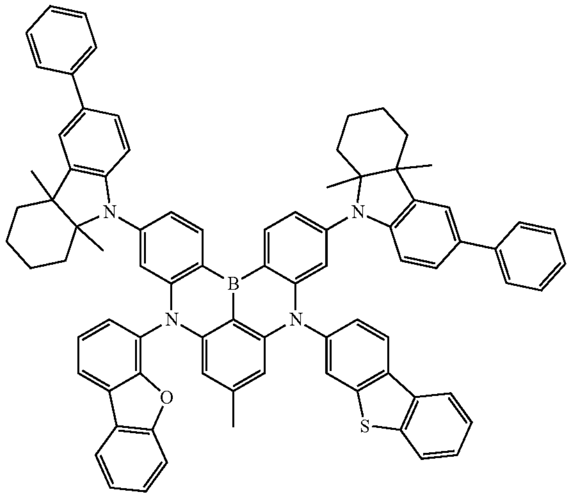
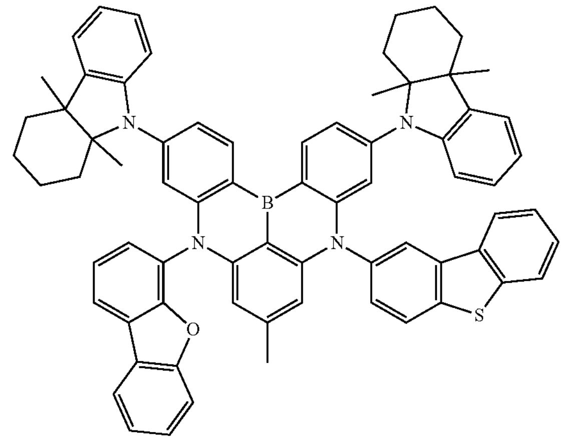
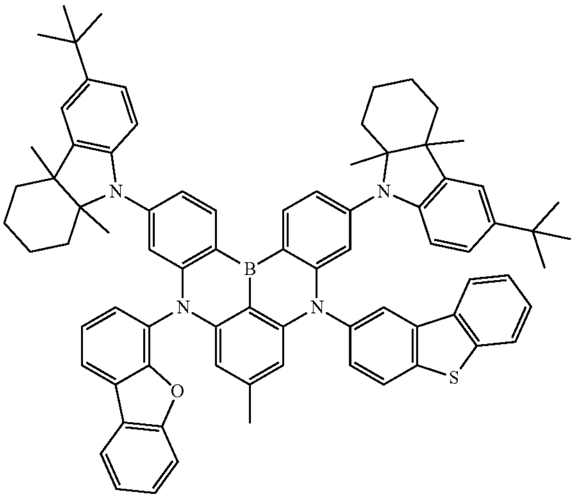

-continued
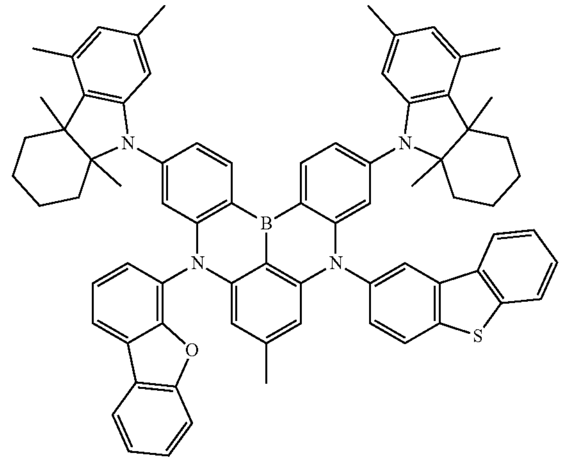
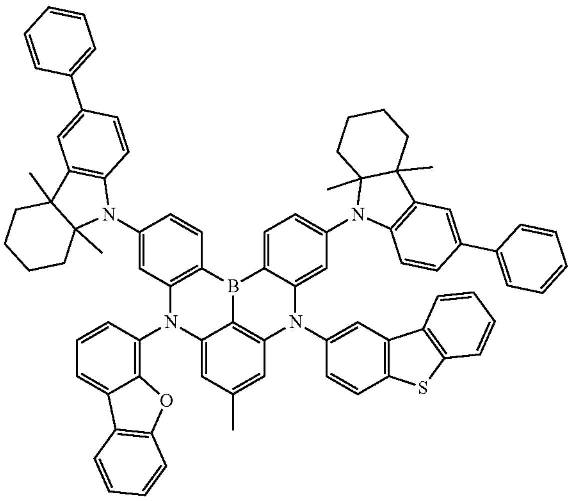
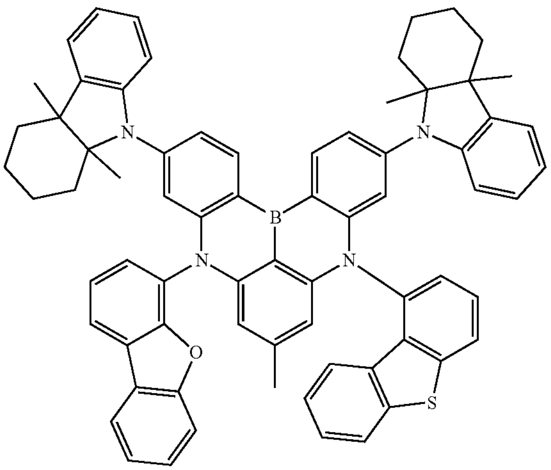
-continued
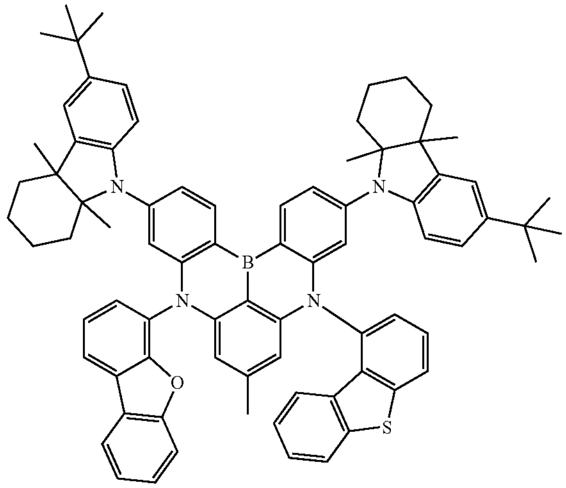
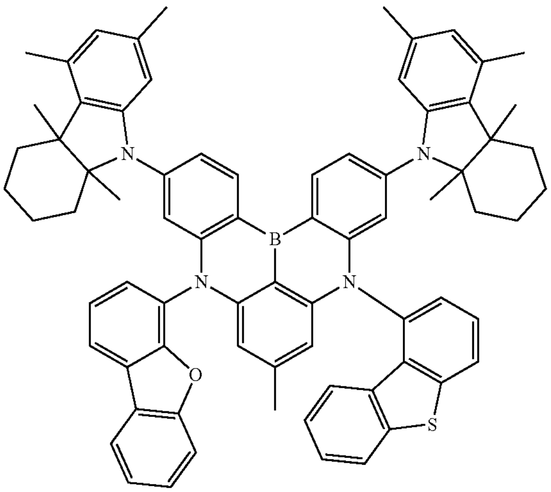
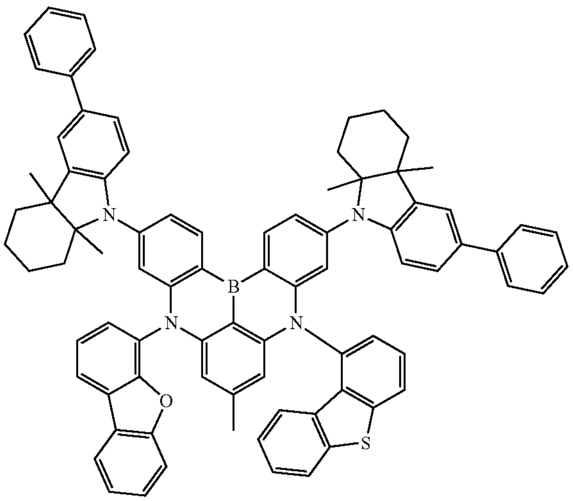

-continued
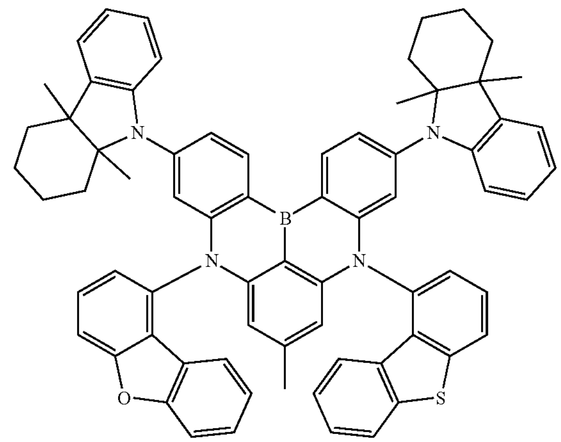
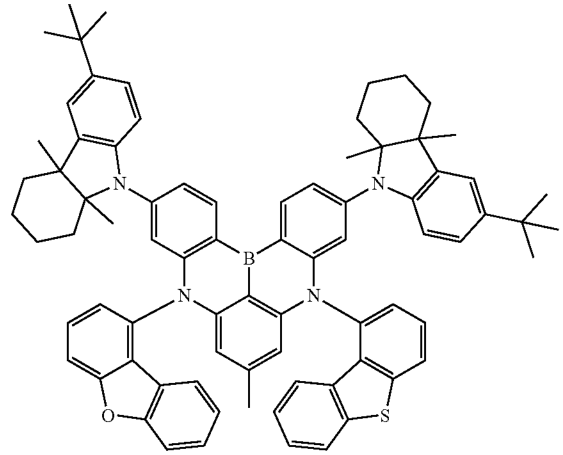
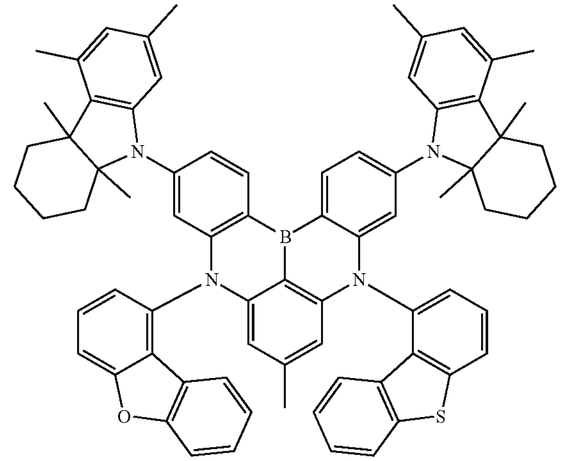
-continued
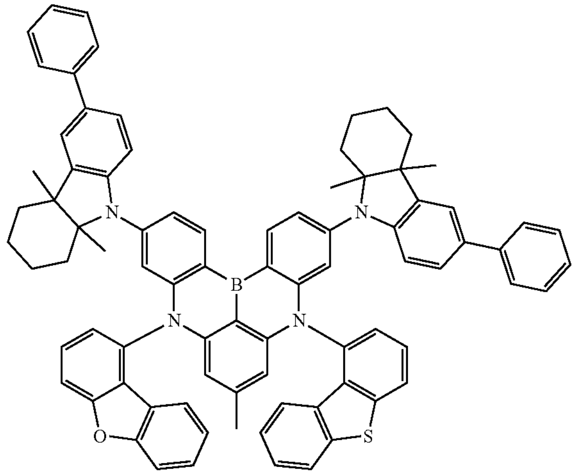
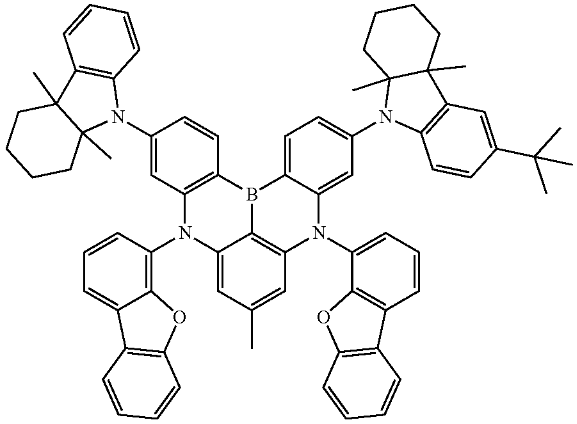
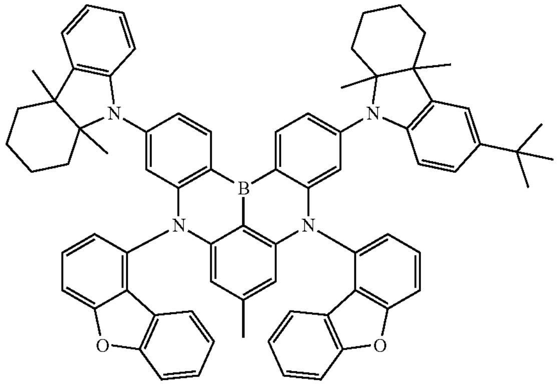
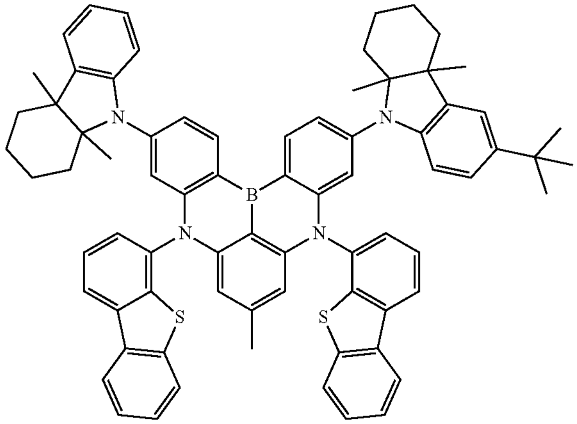

-continued
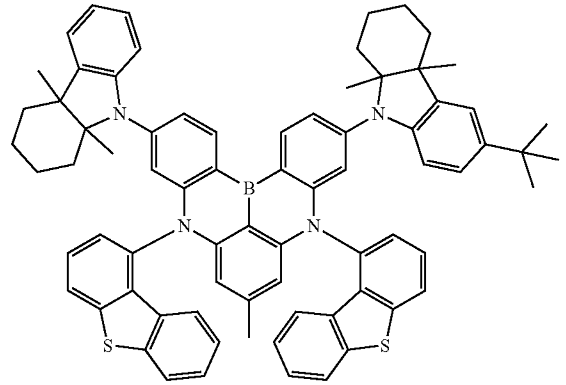
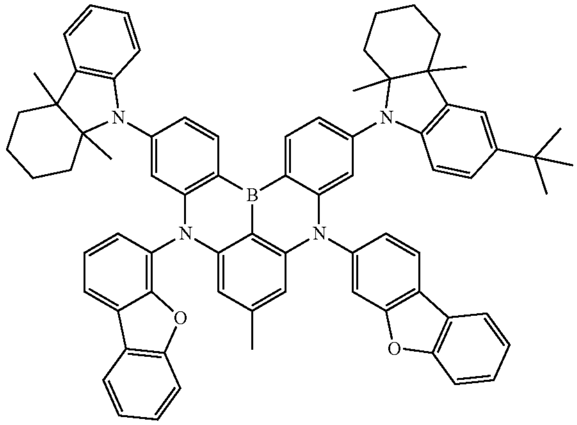
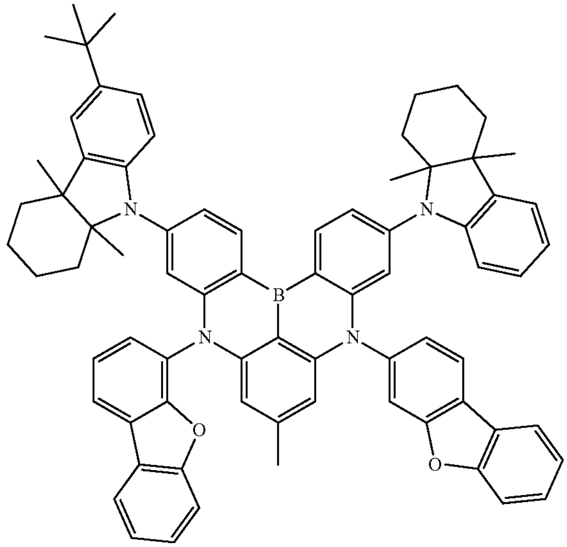
-continued
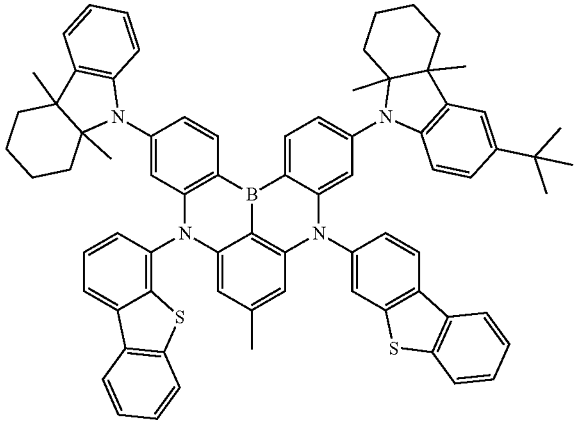
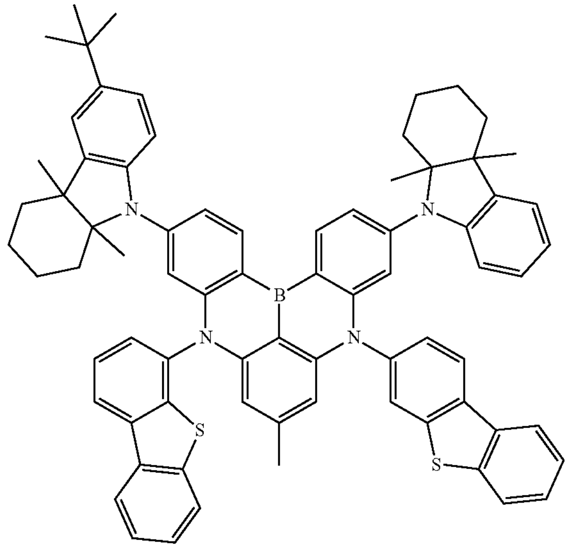
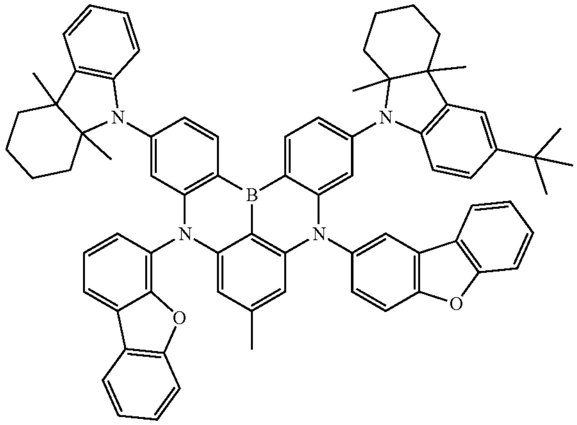

-continued
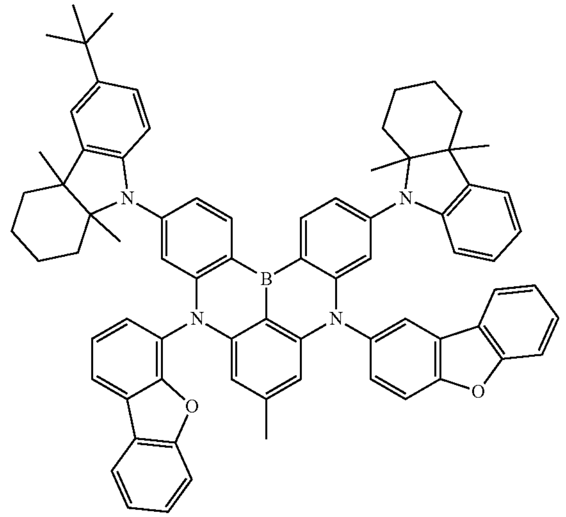
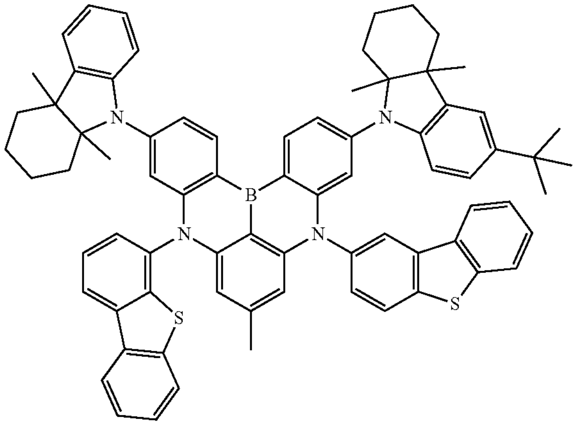
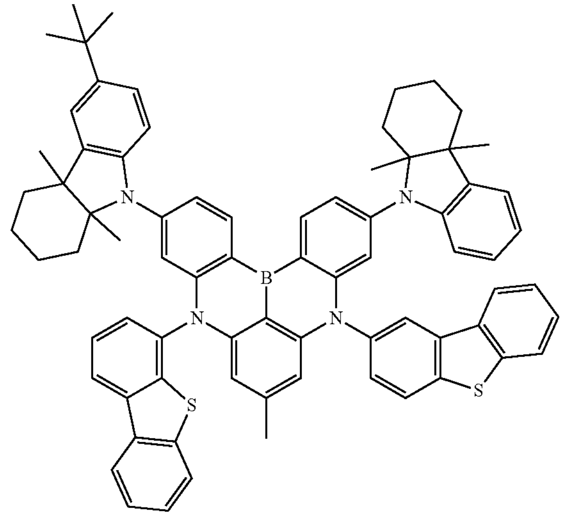
-continued
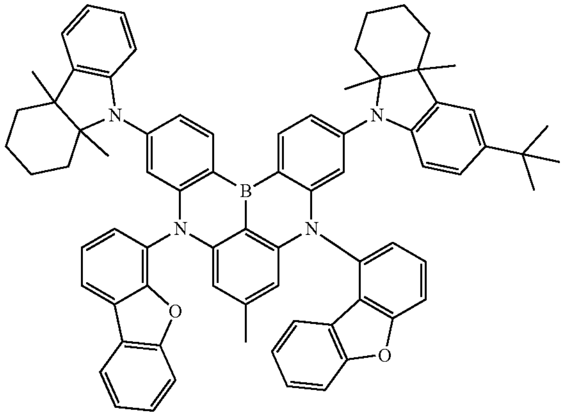
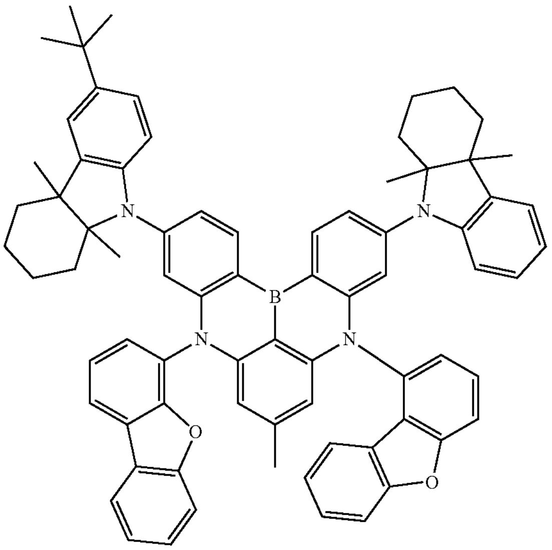
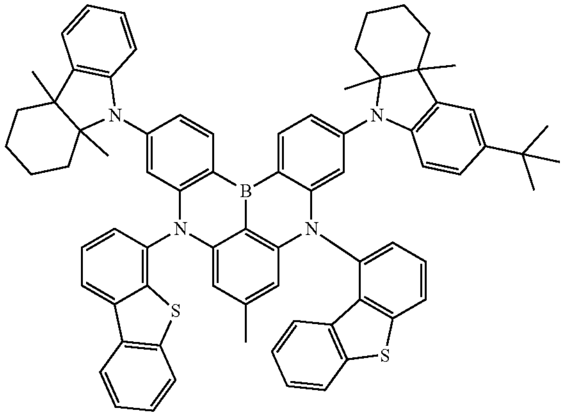

-continued
-continued
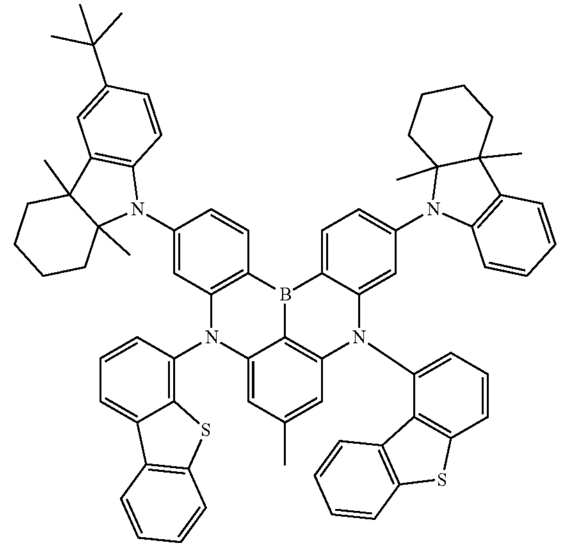
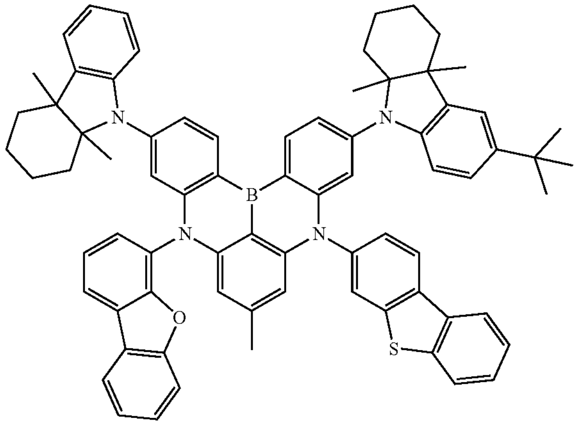
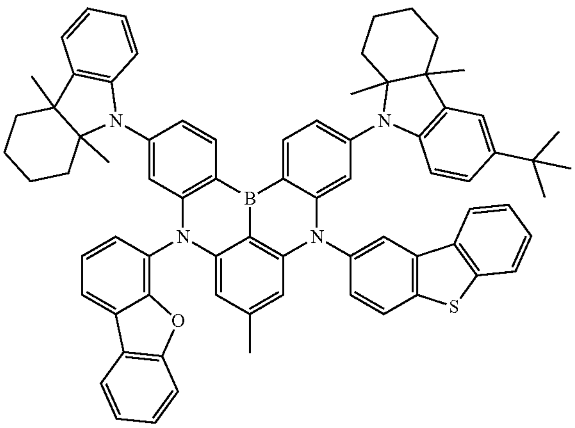
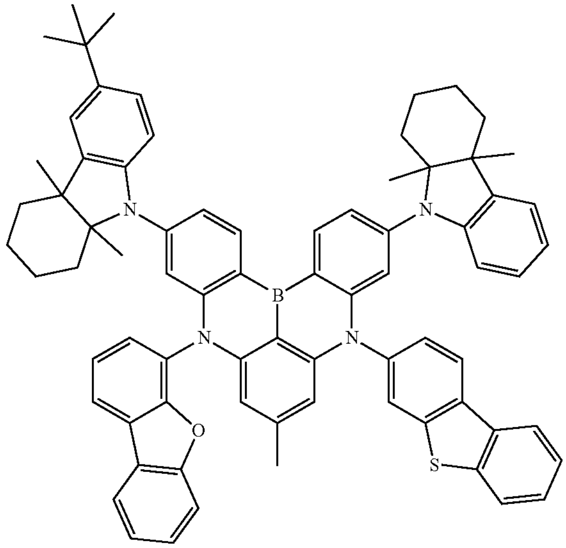
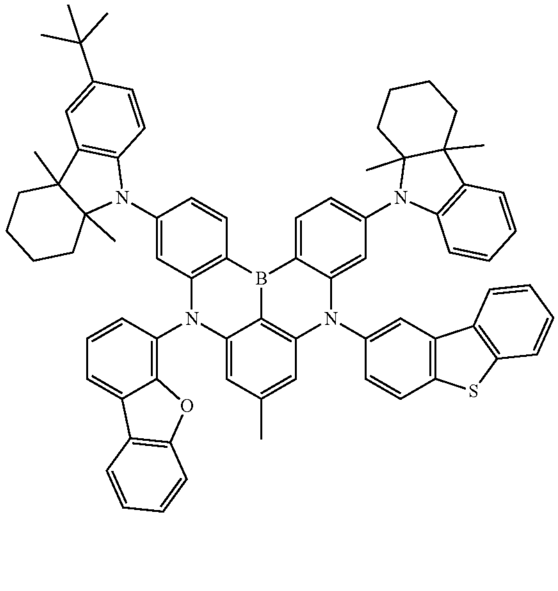
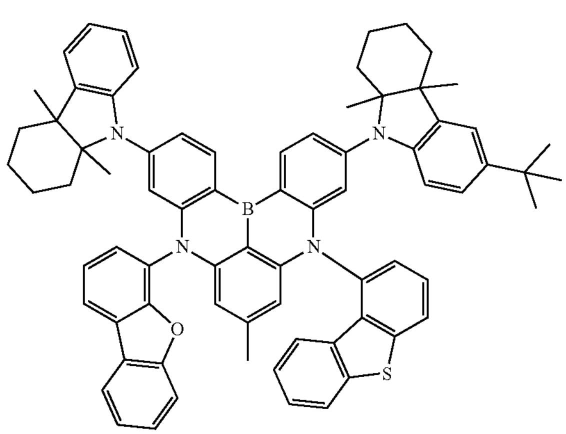

-continued
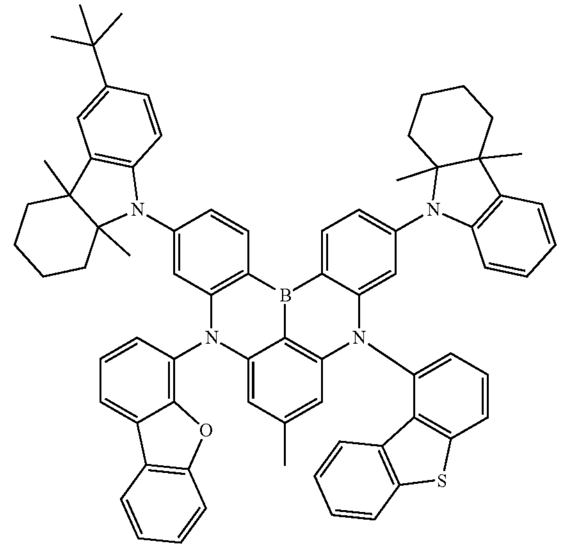
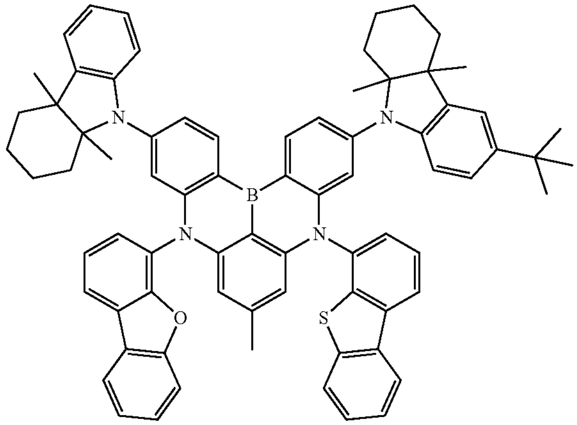
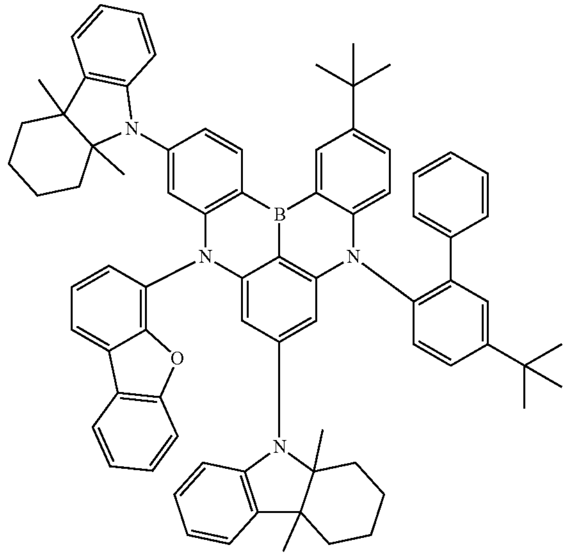
-continued
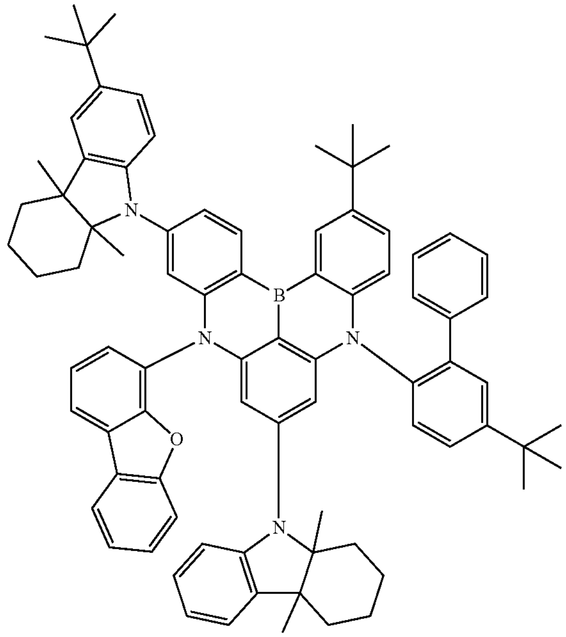
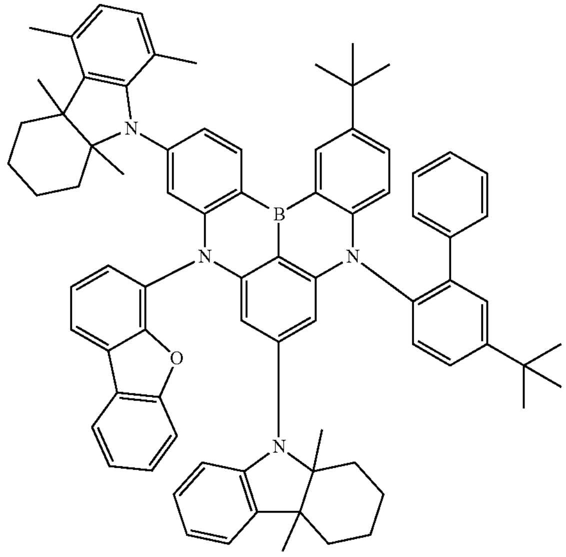

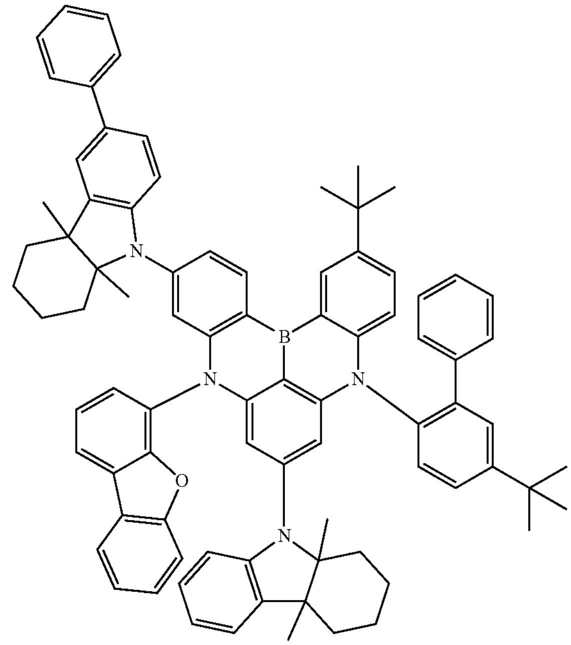
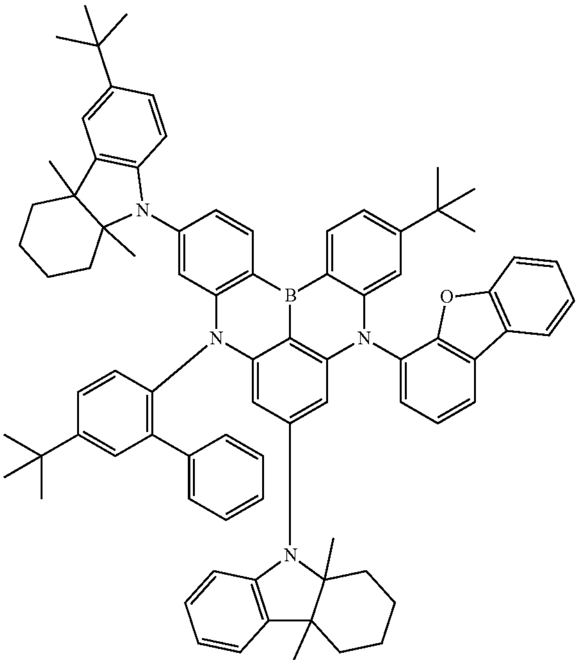
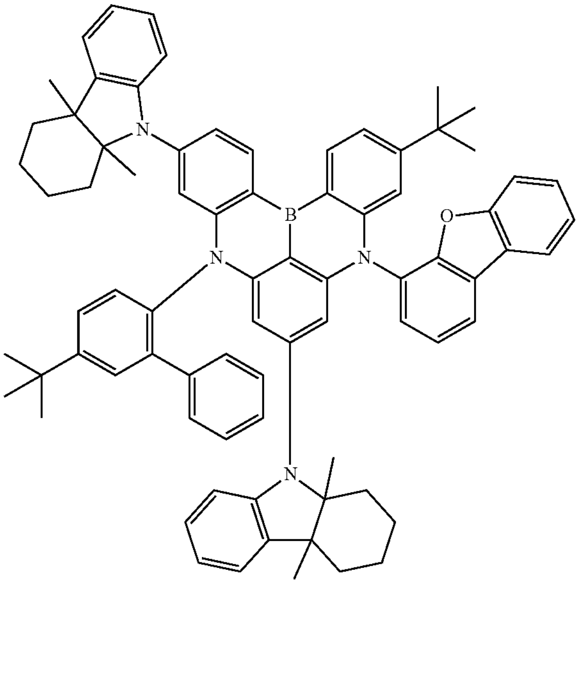
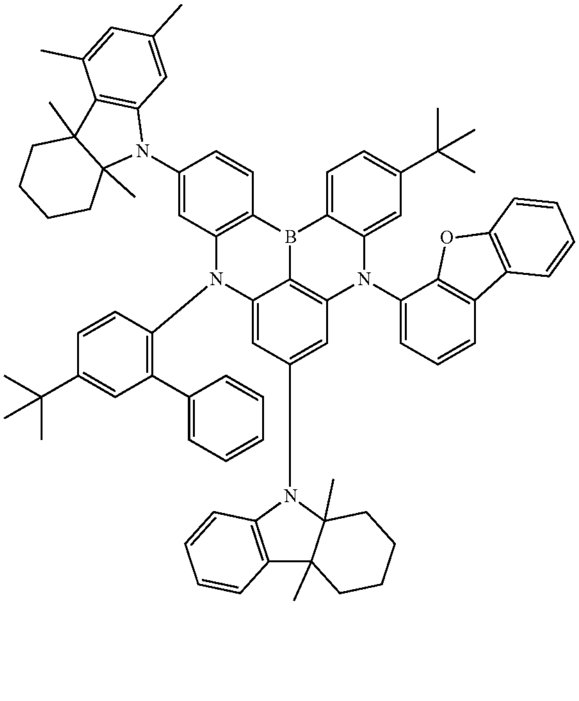

-continued
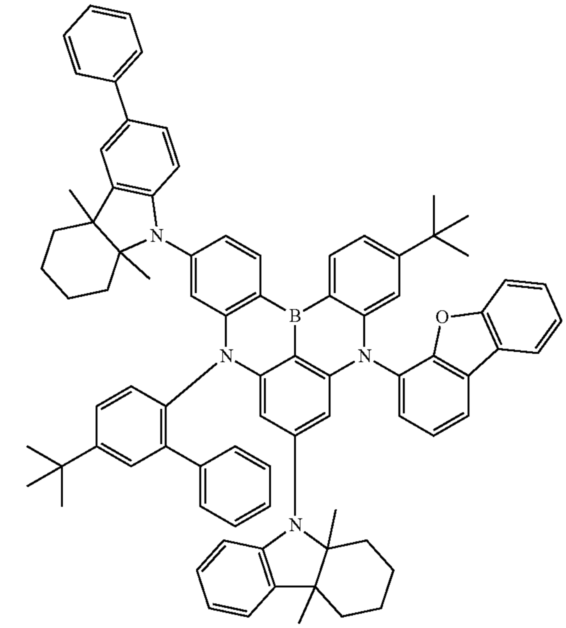
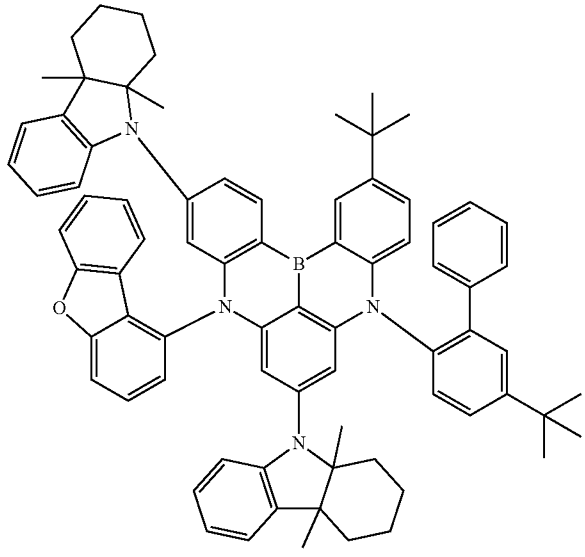
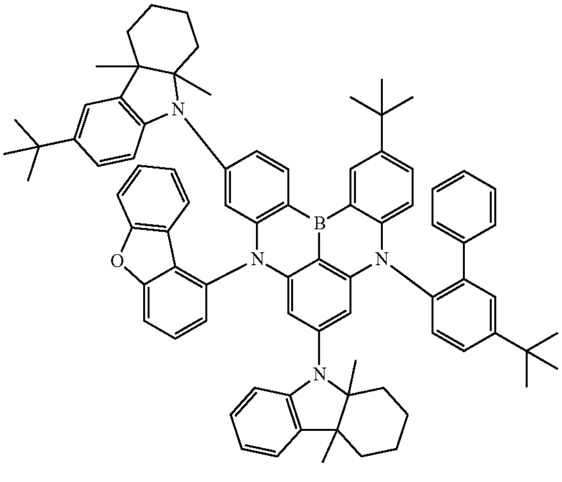
-continued
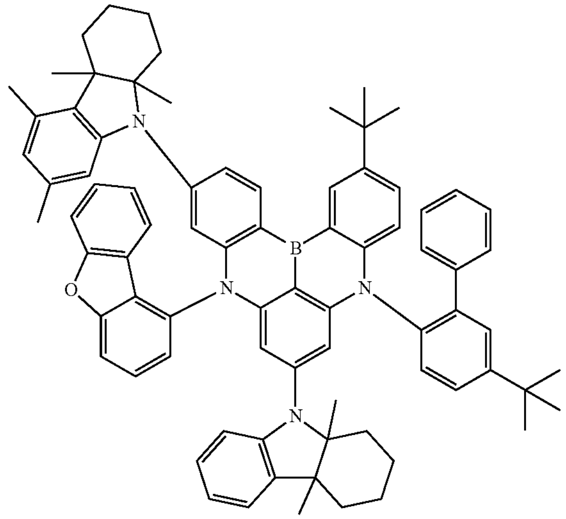
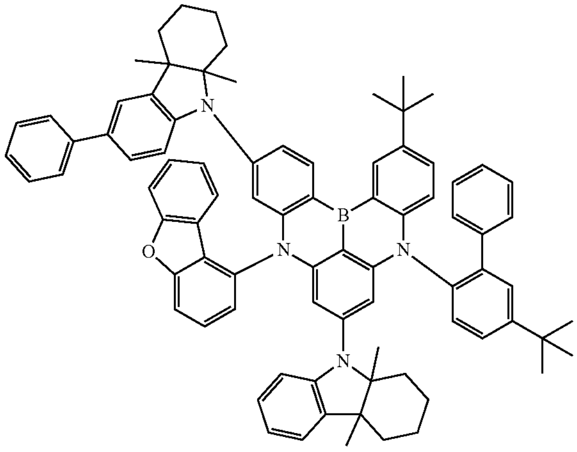
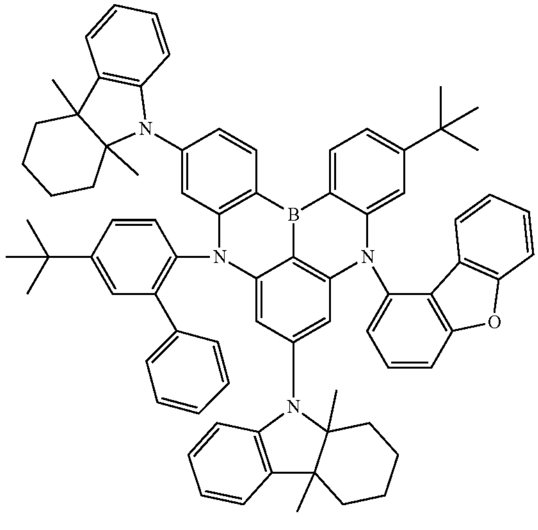

-continued
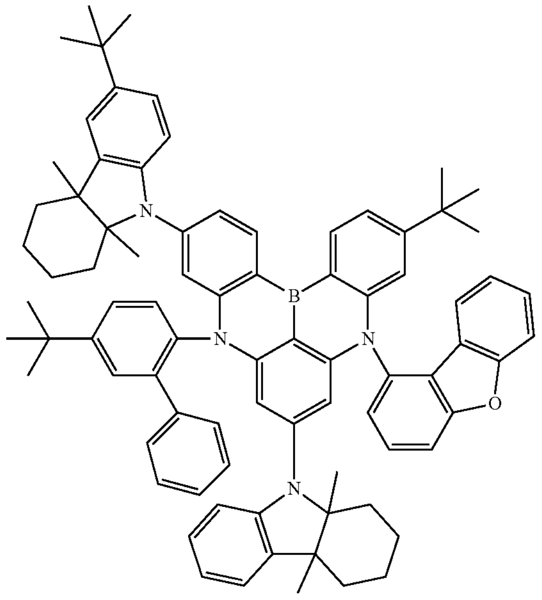
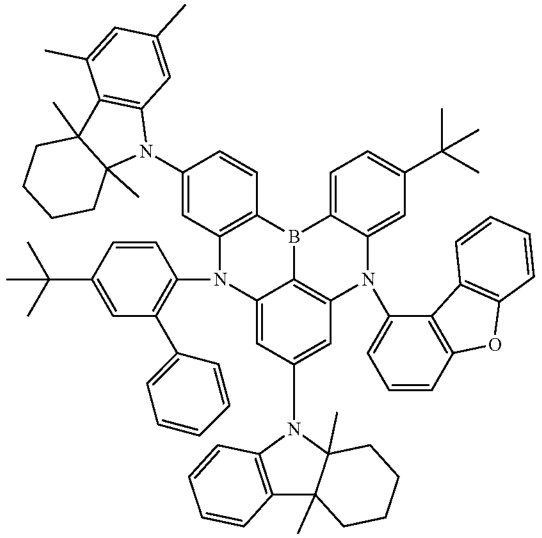
-continued
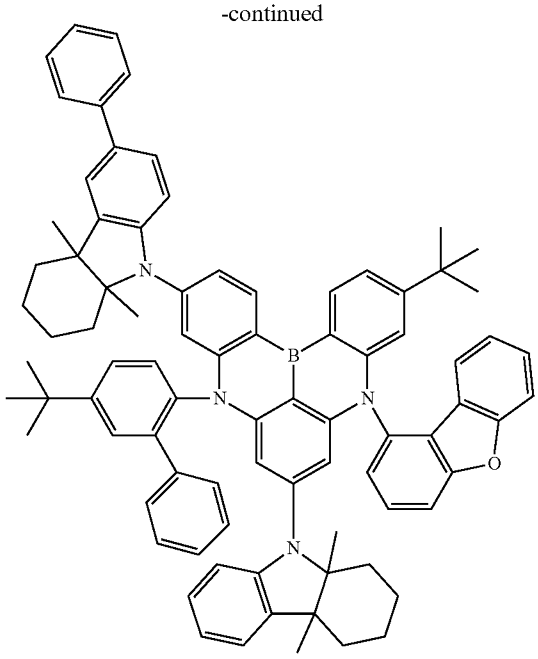
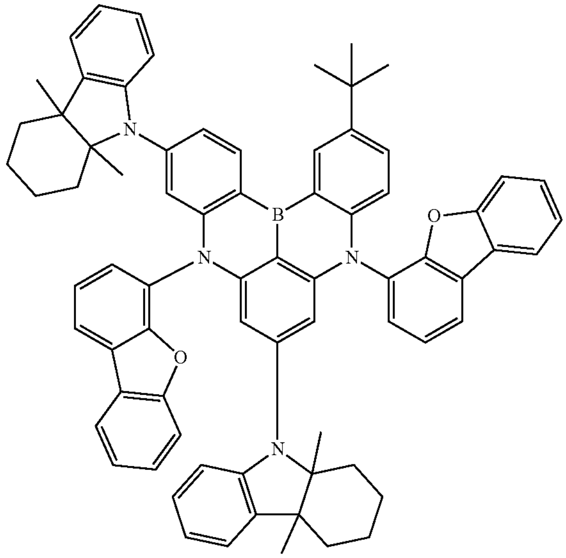
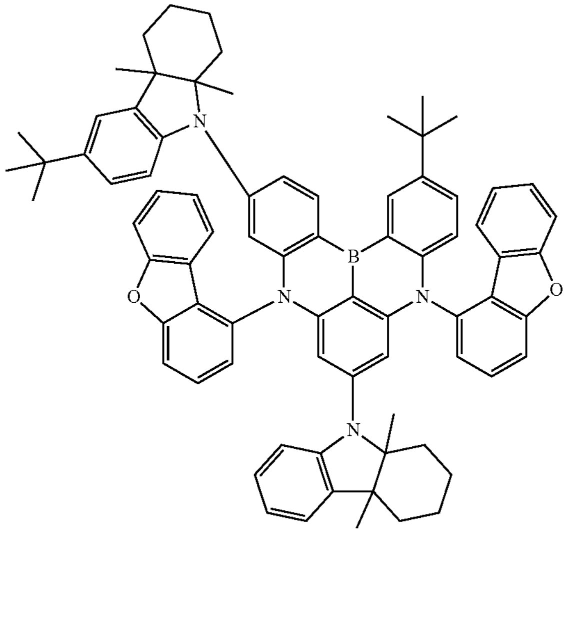

-continued
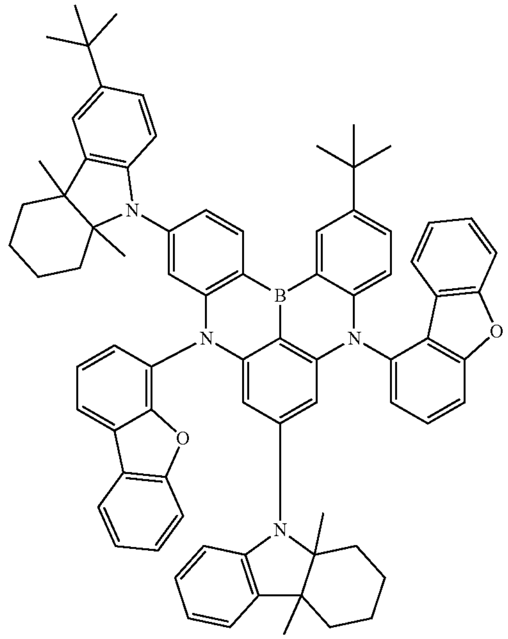
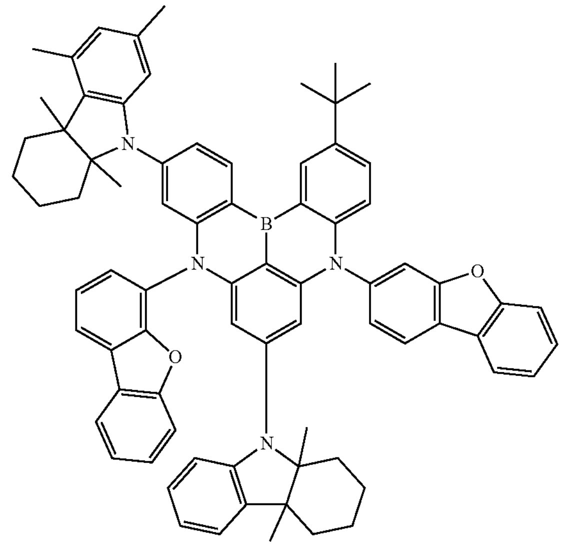
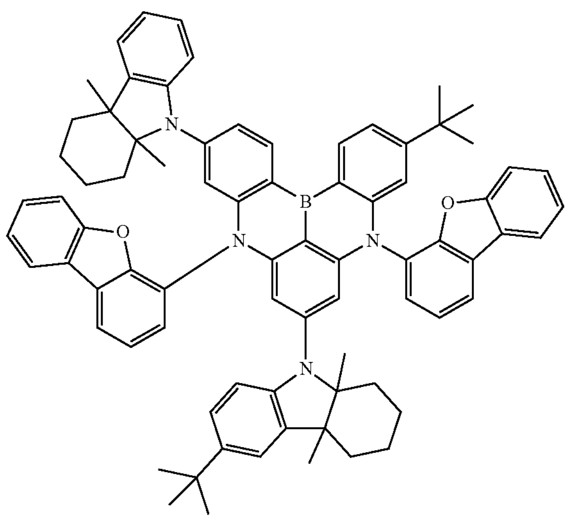
-continued
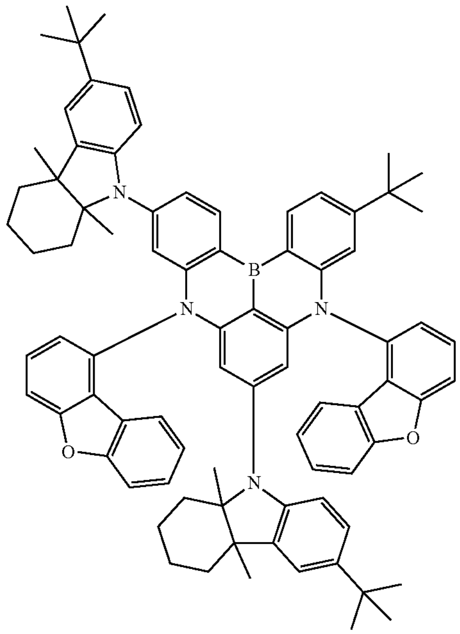
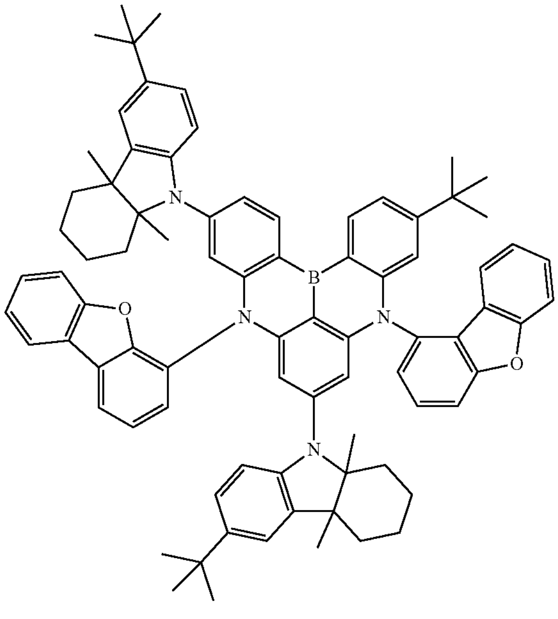

-continued
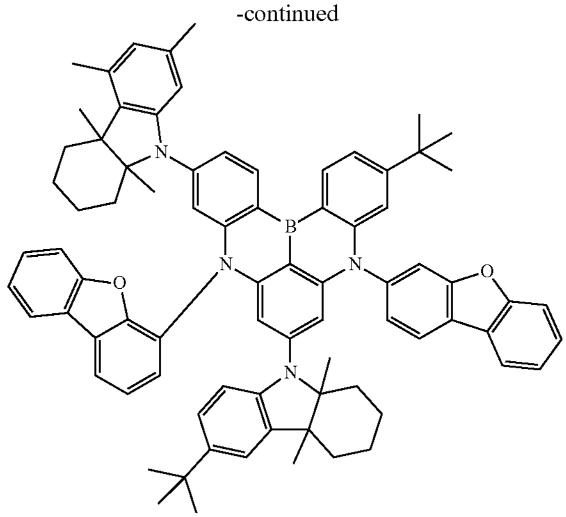
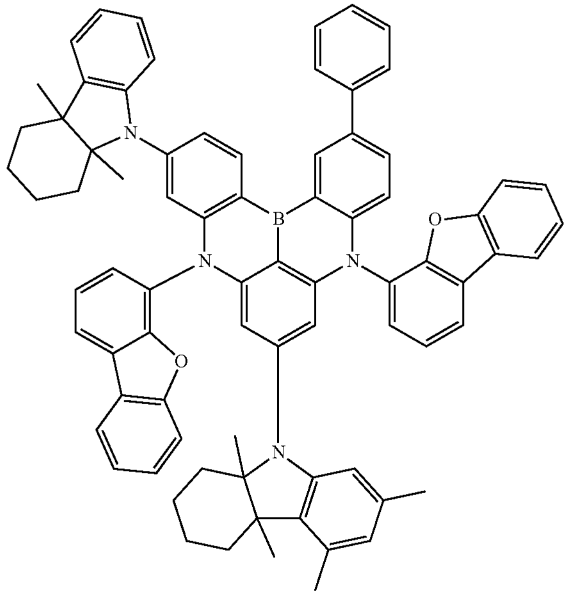
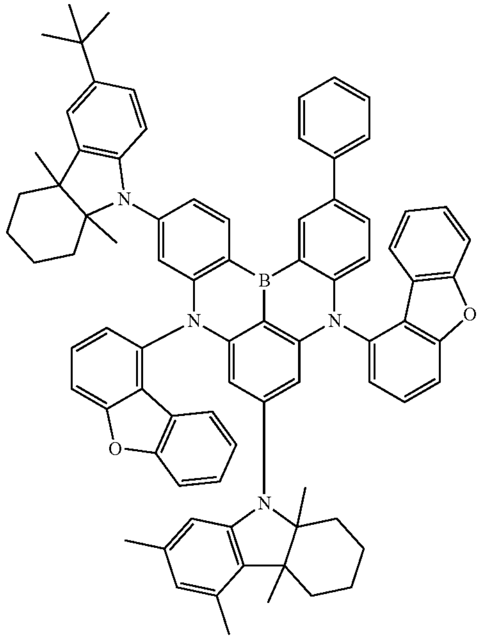
-continued
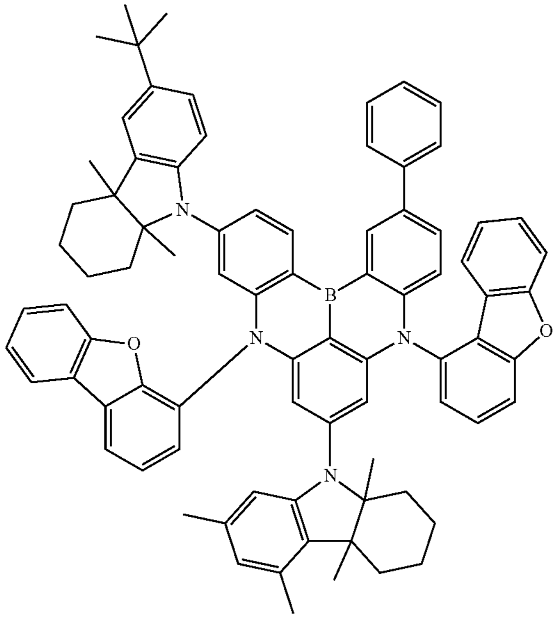
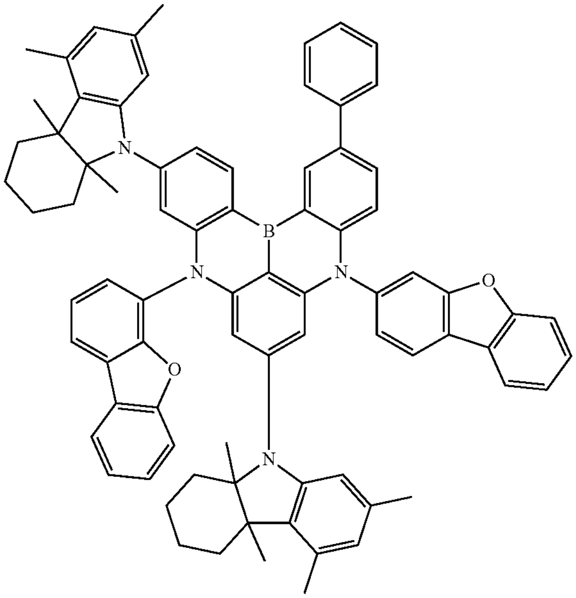

-continued
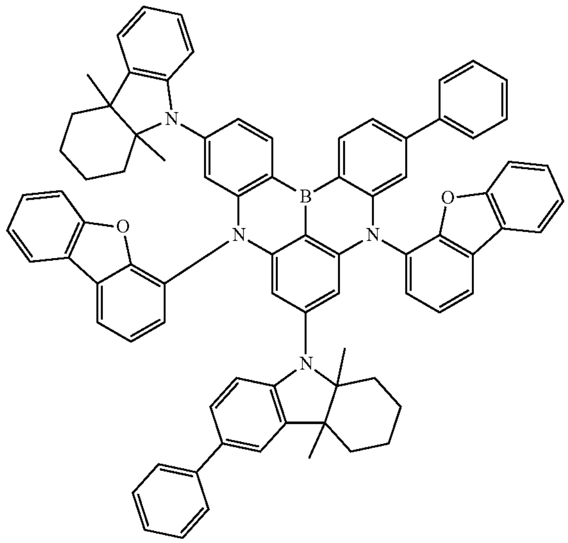
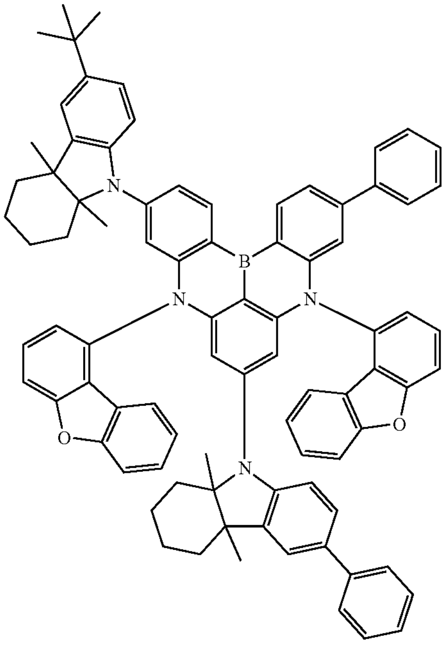
-continued
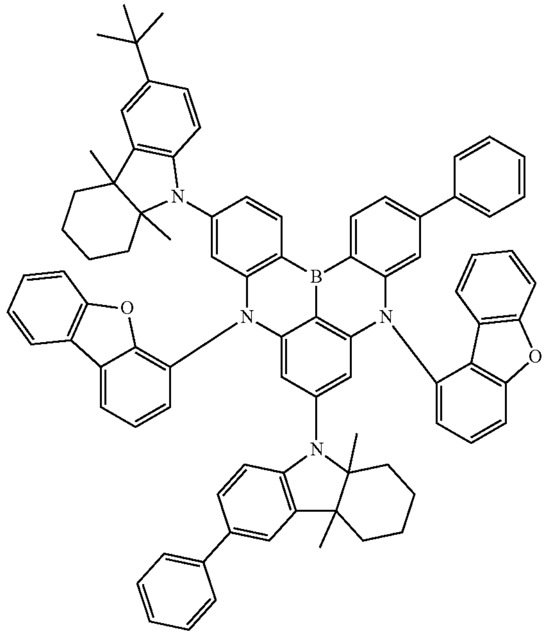
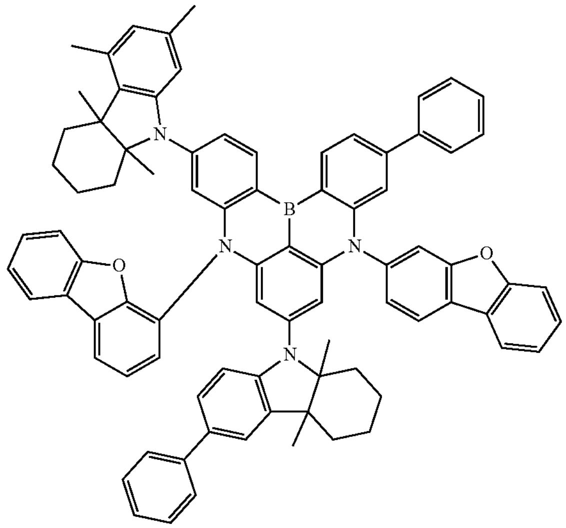

-continued
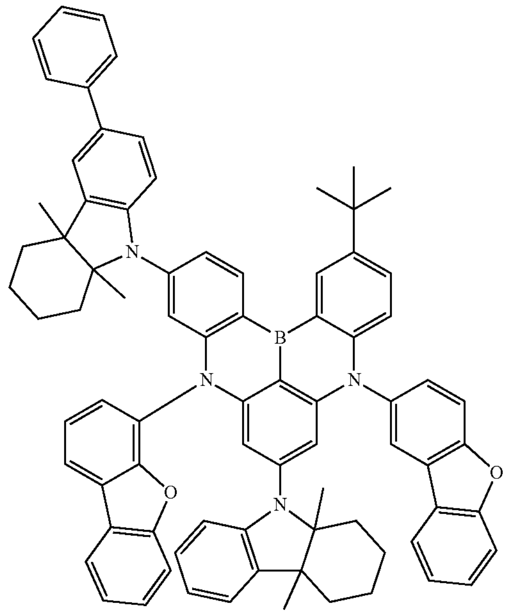
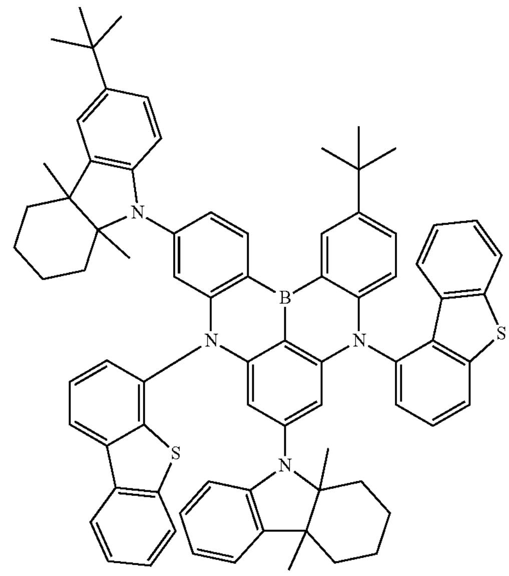
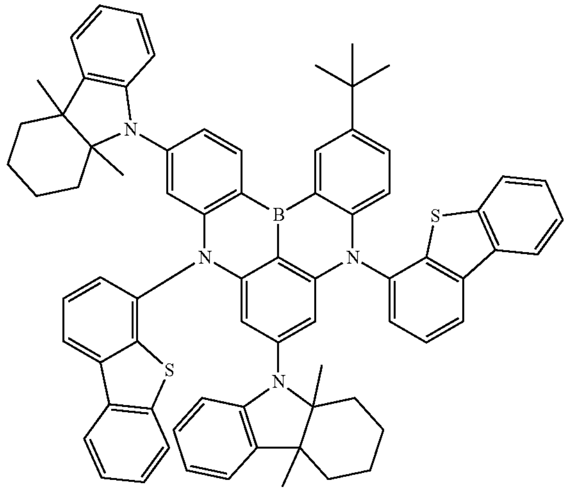
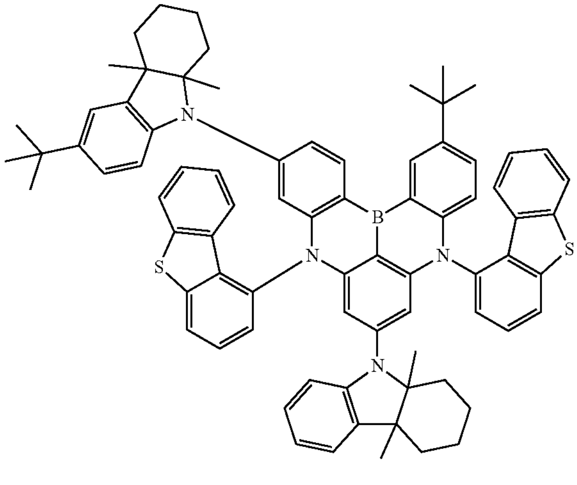
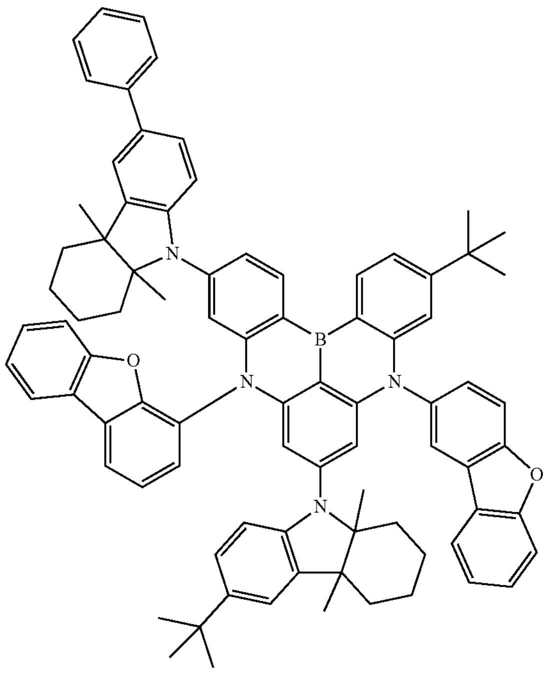

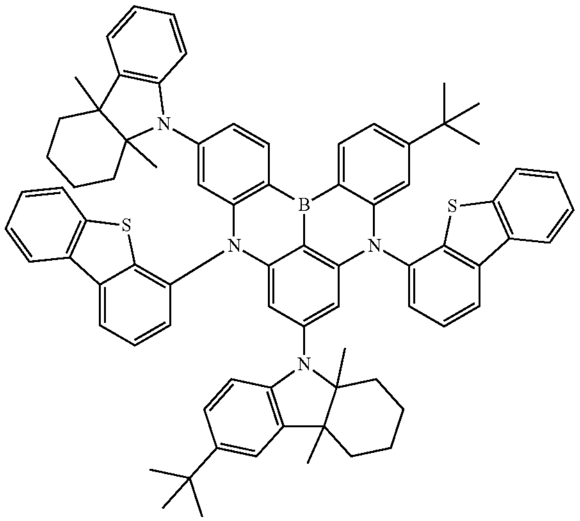
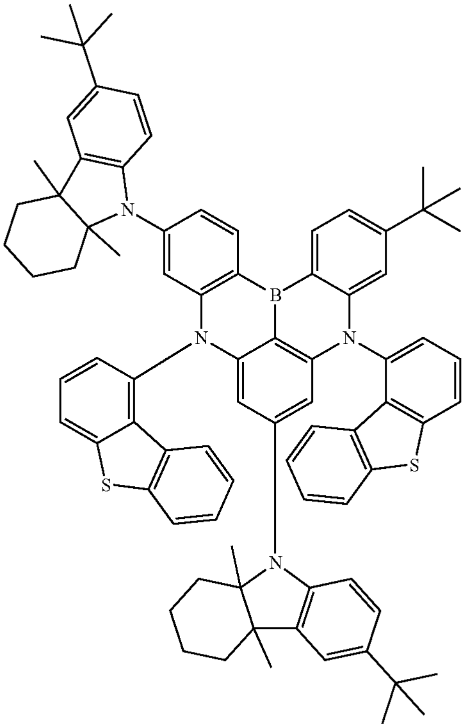
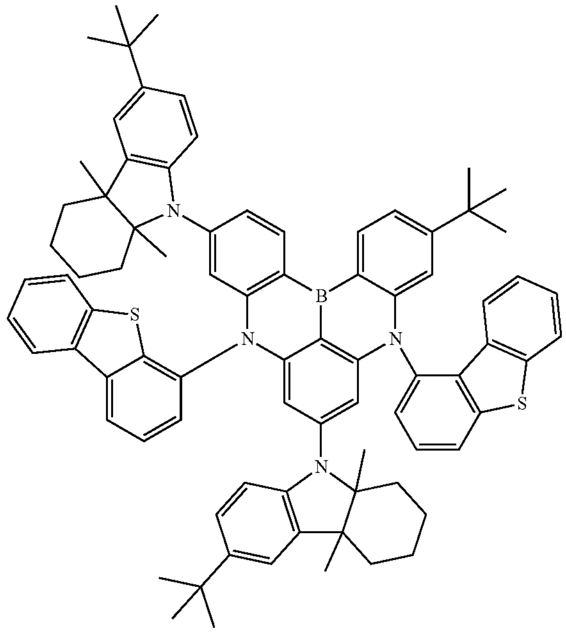
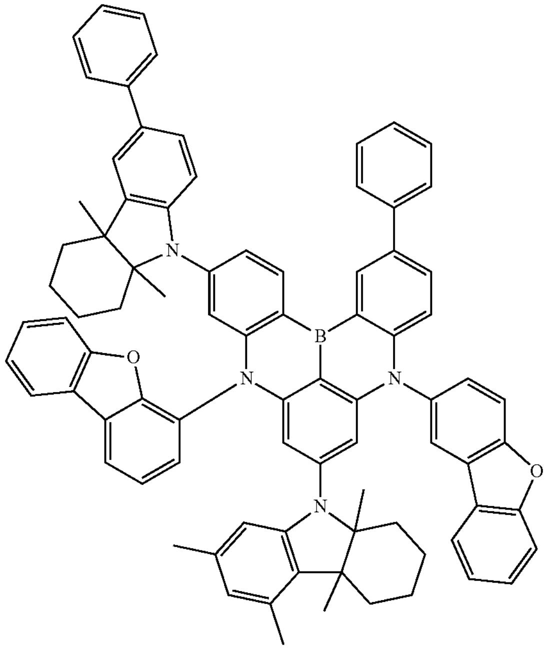

-continued
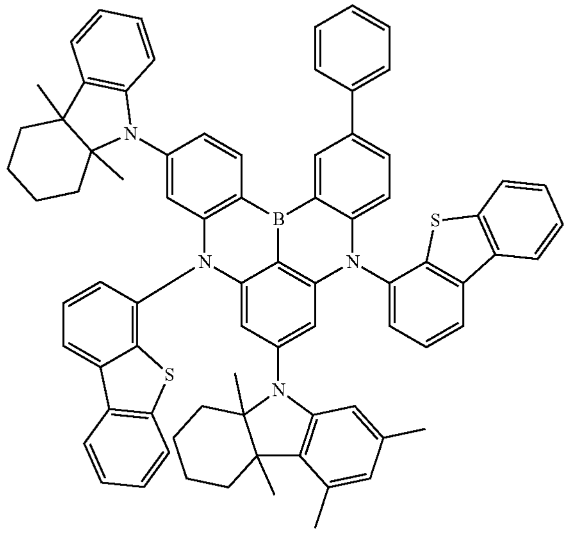
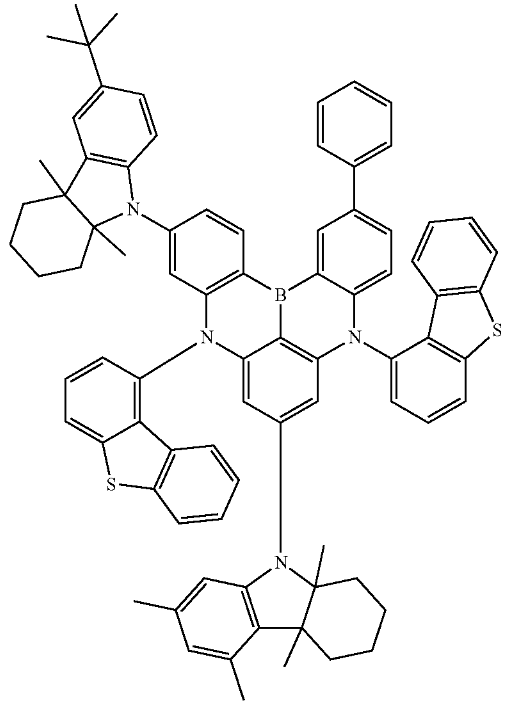
-continued
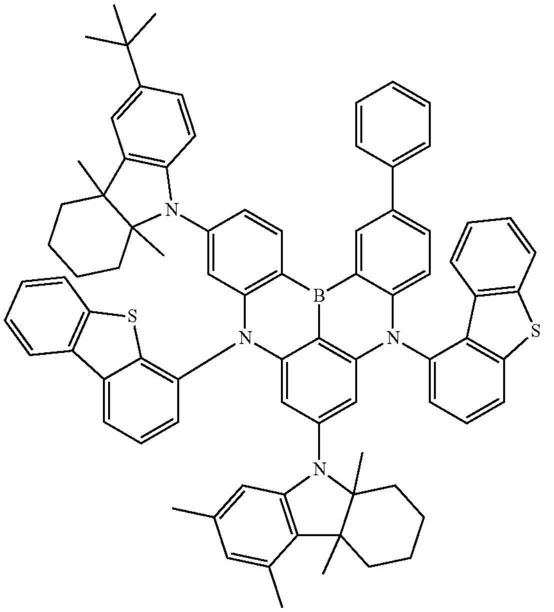
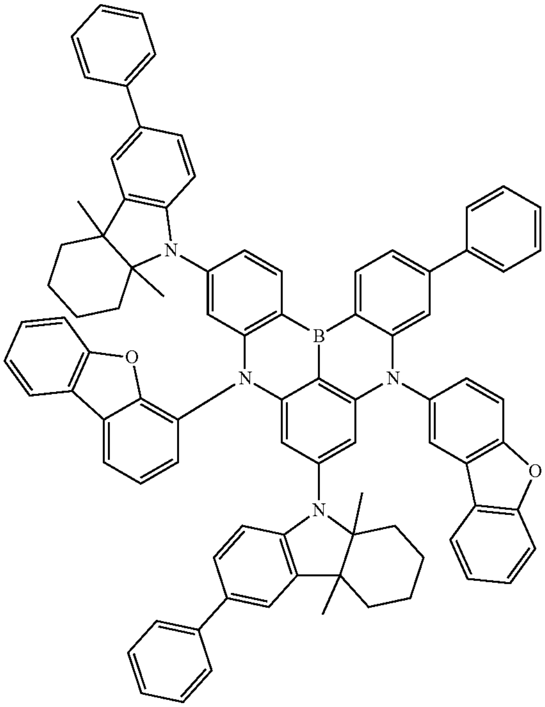

-continued
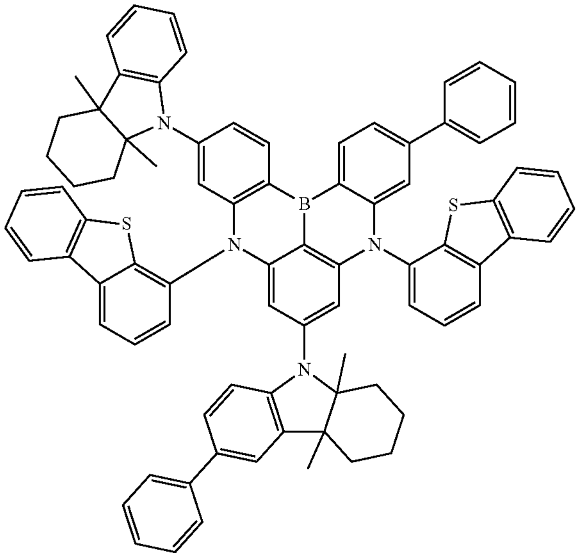
-continued
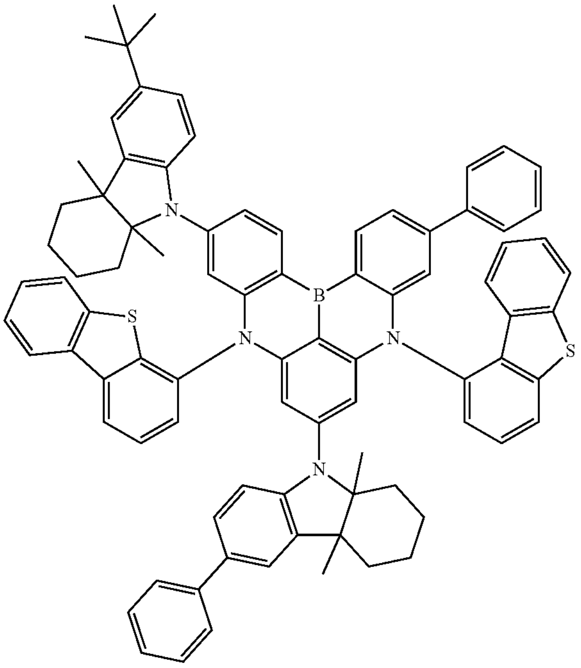
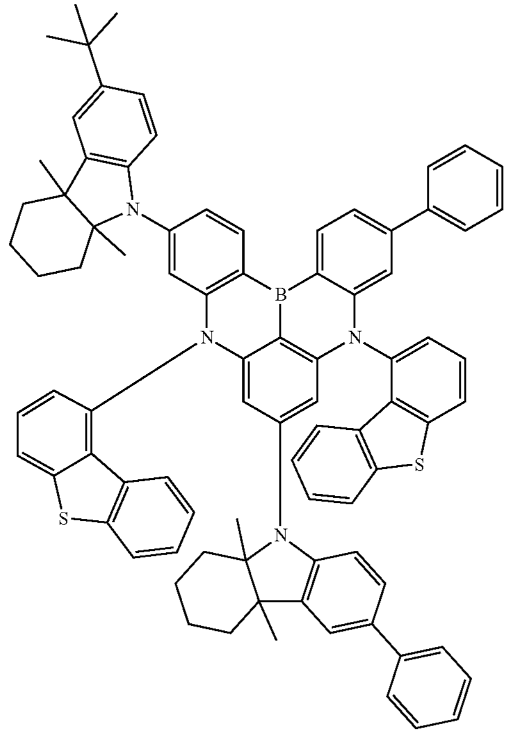
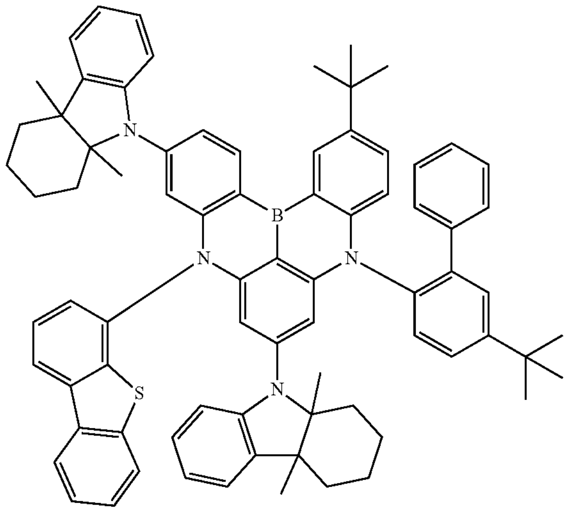

-continued
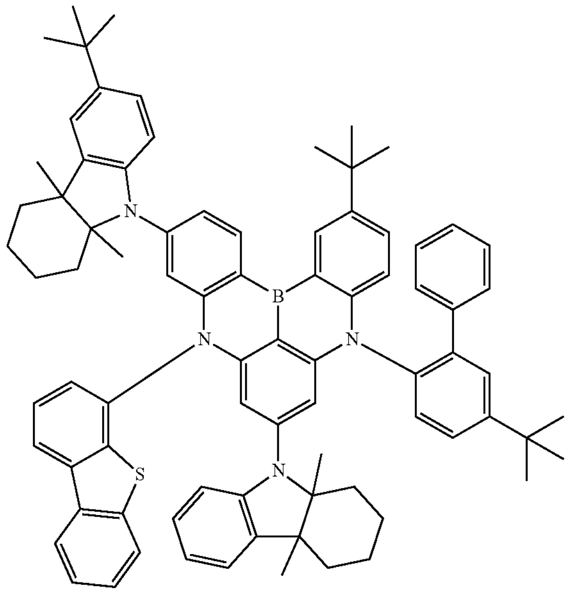
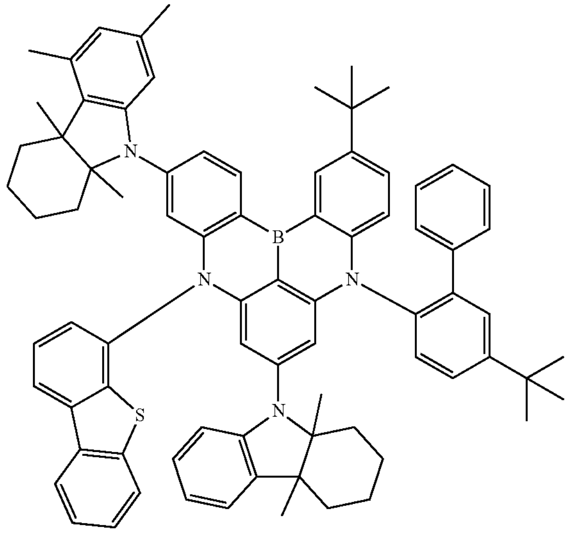
-continued
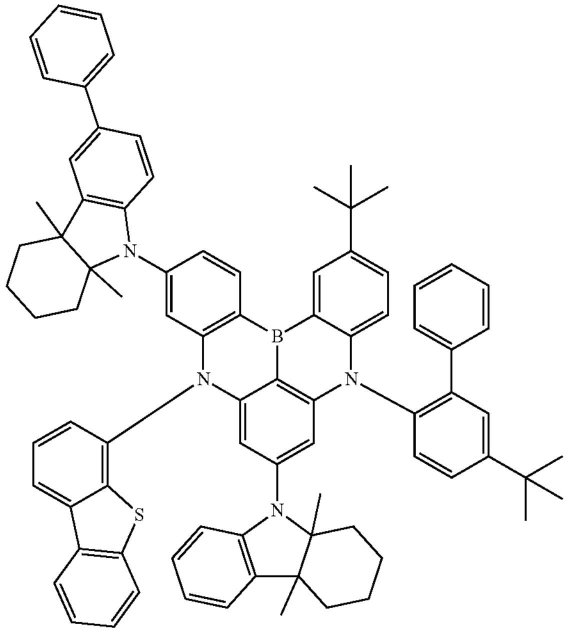
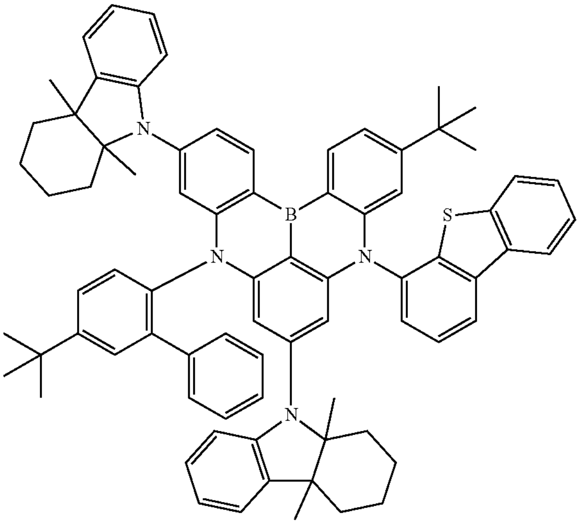

-continued
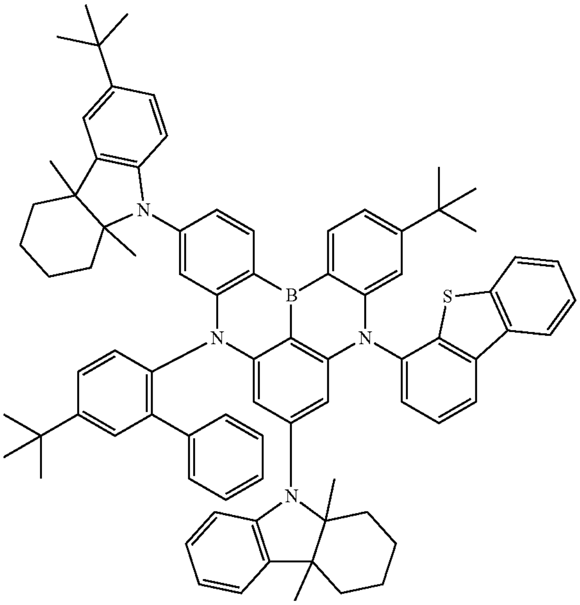
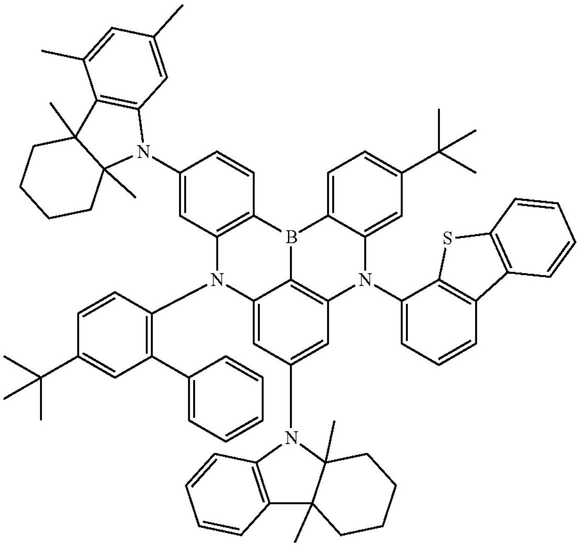
-continued
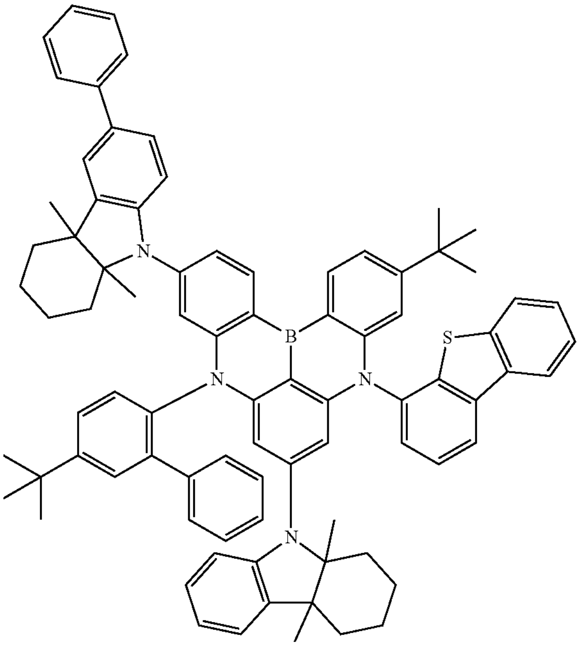
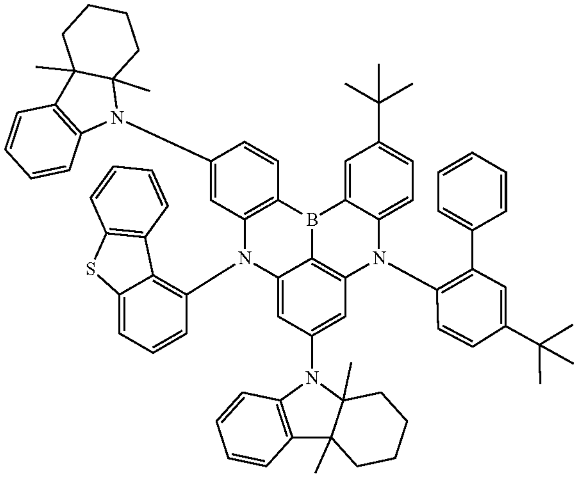
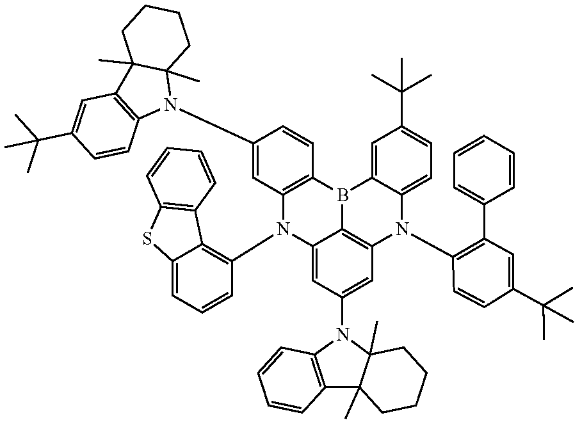

-continued
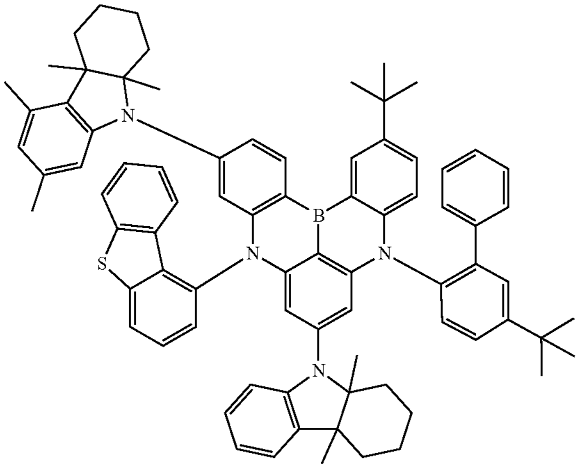
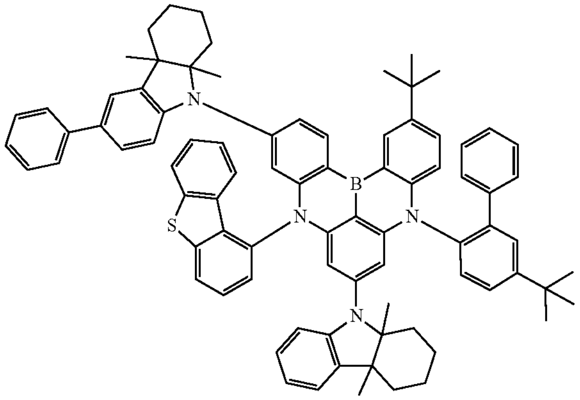
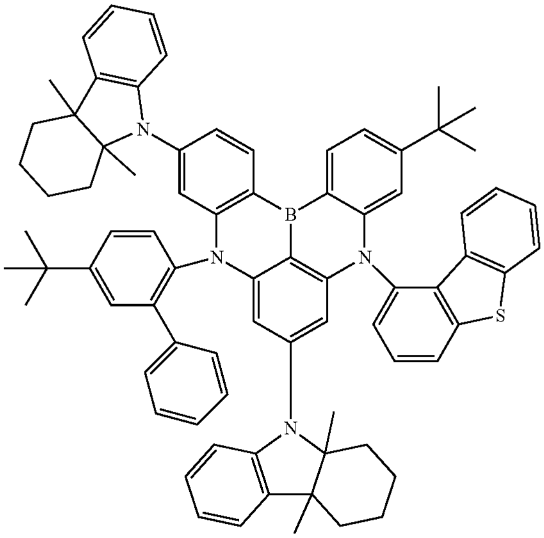
-continued
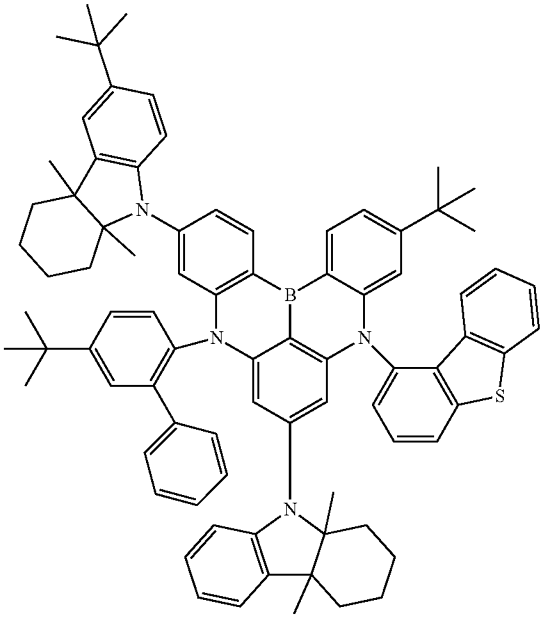
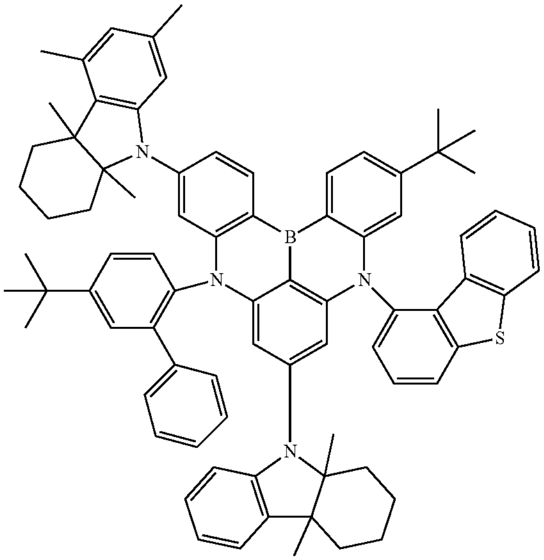

-continued
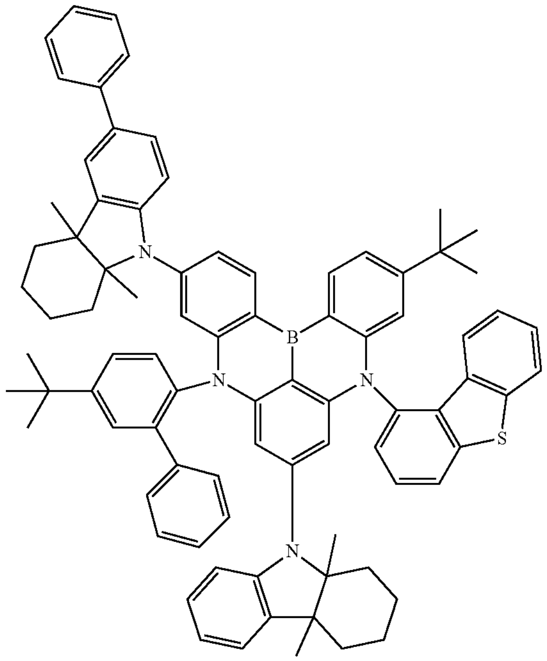
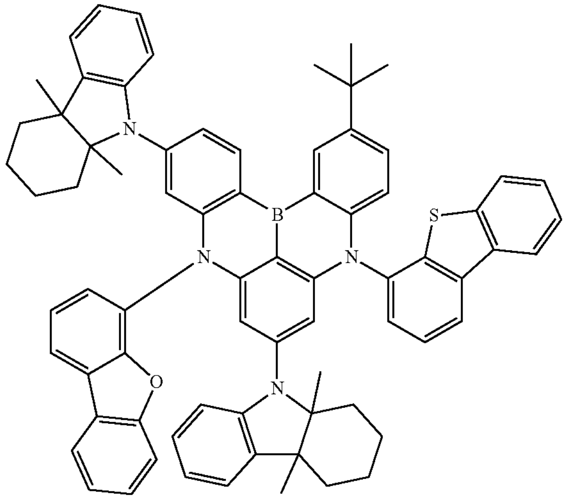
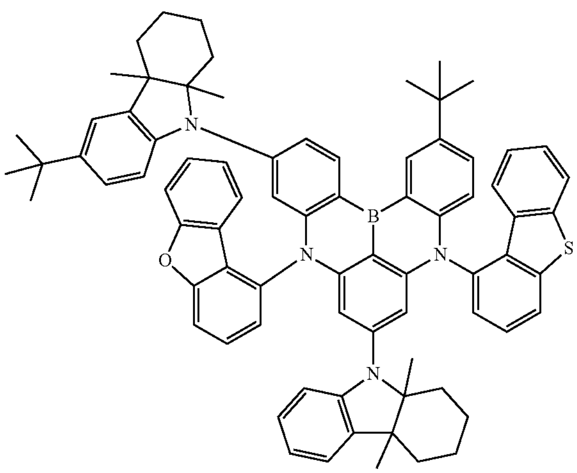
-continued
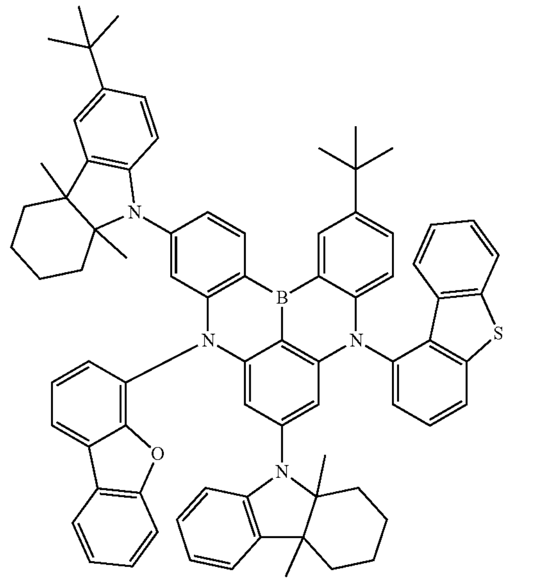
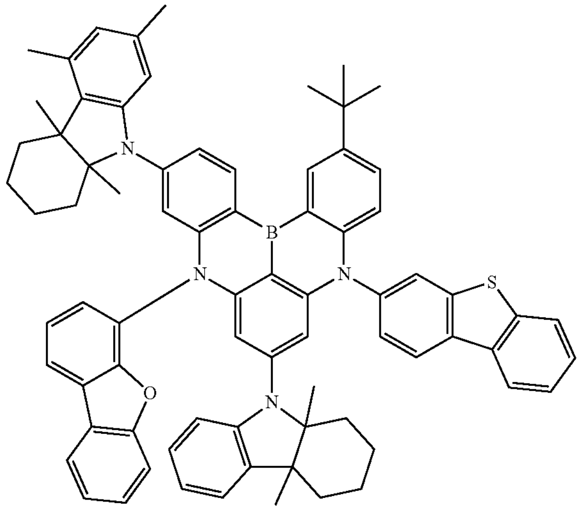
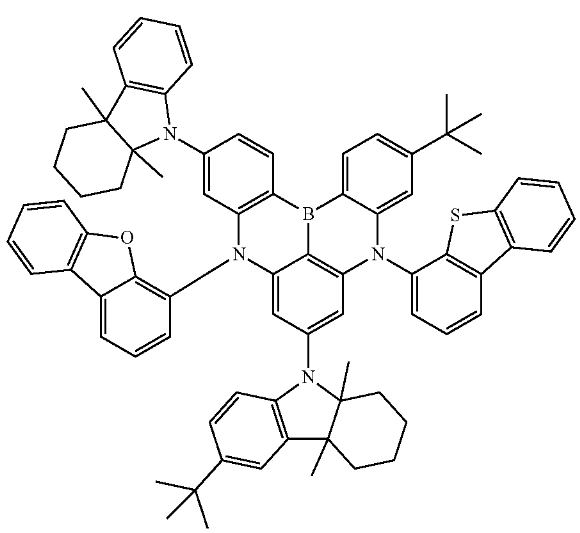

-continued
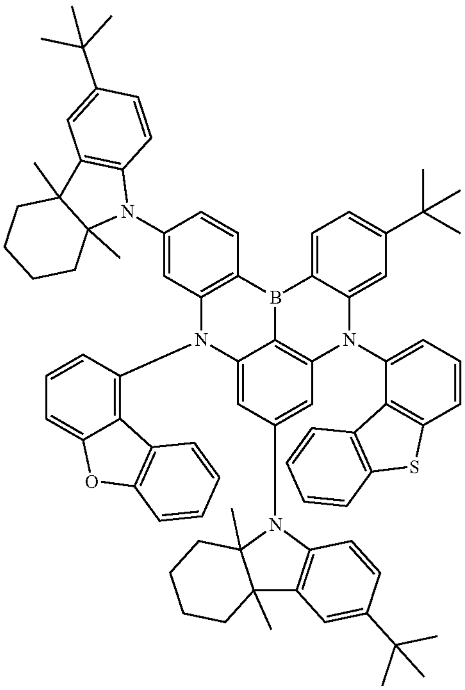
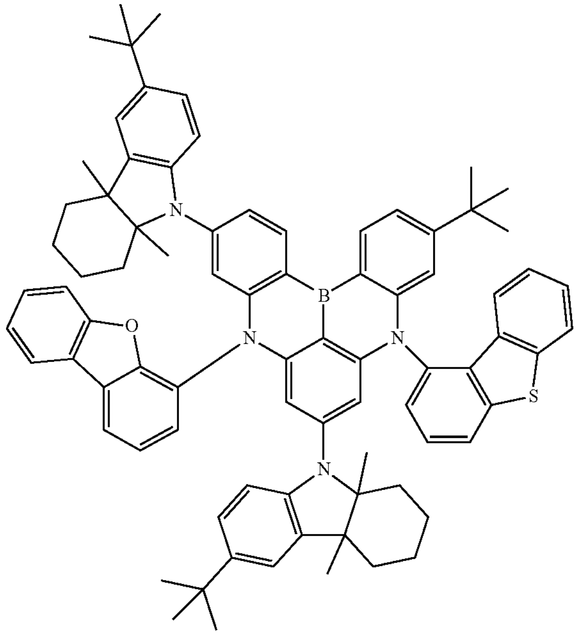
-continued
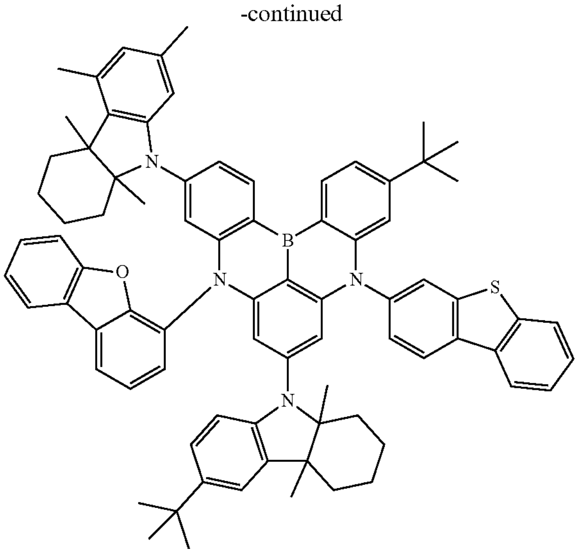
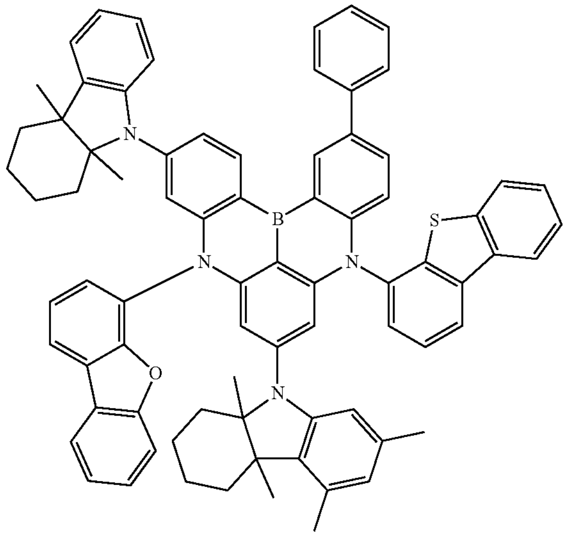
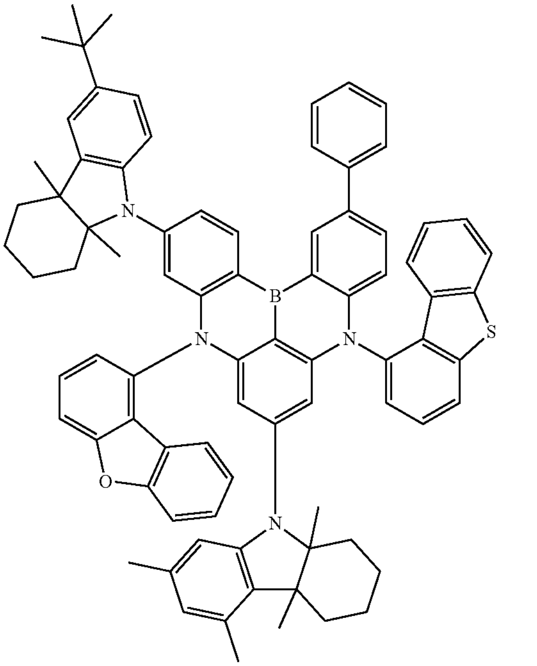

-continued
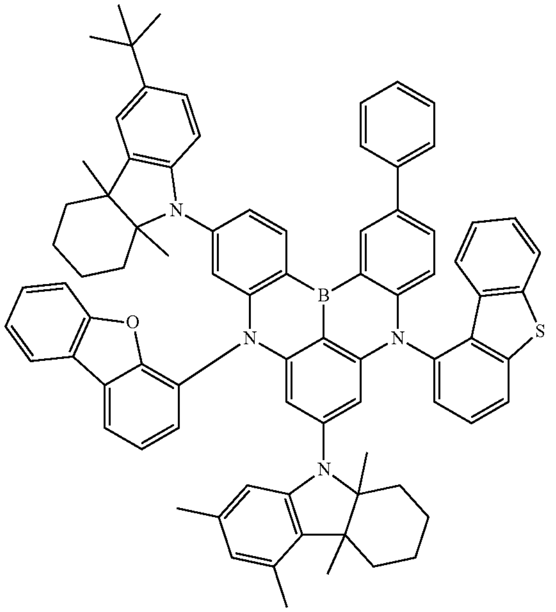
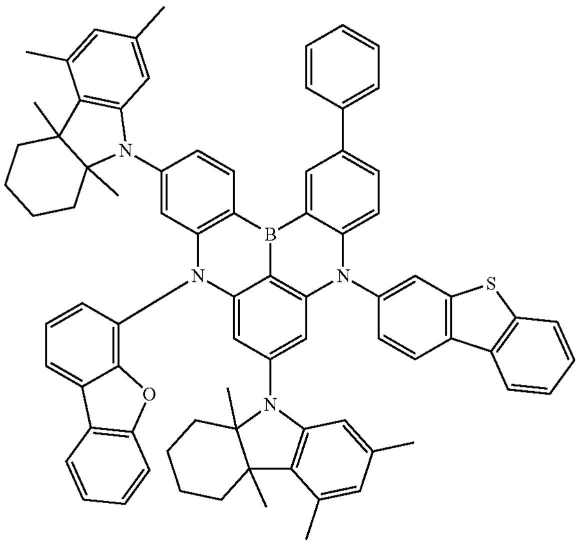
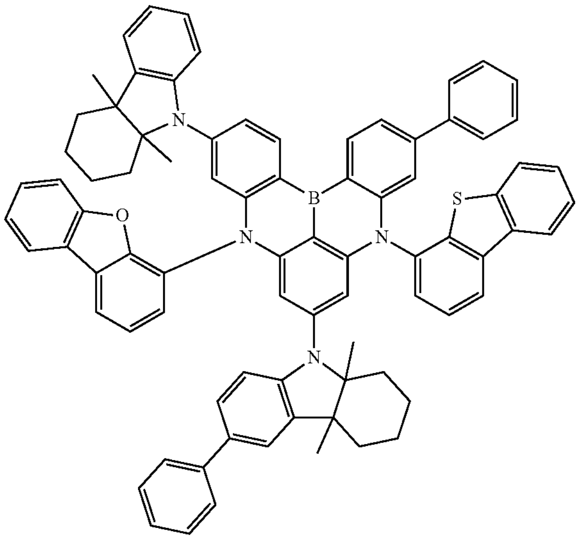
-continued
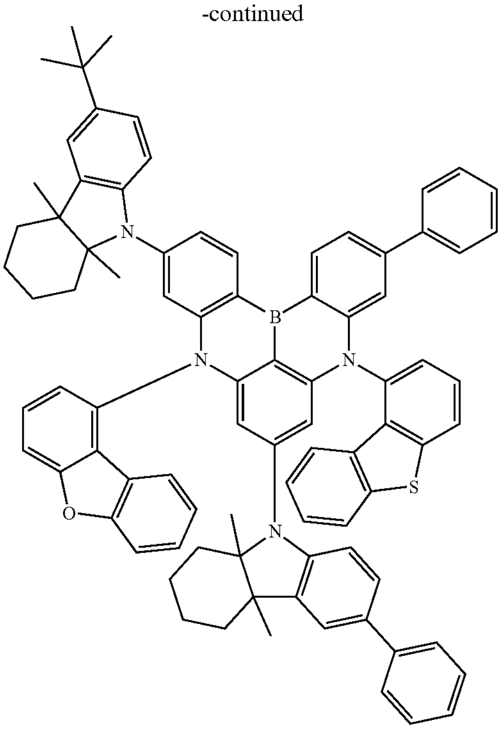
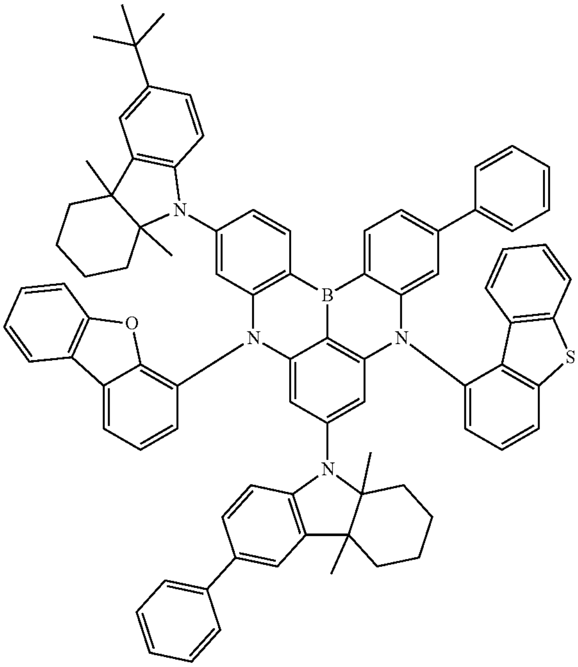

-continued
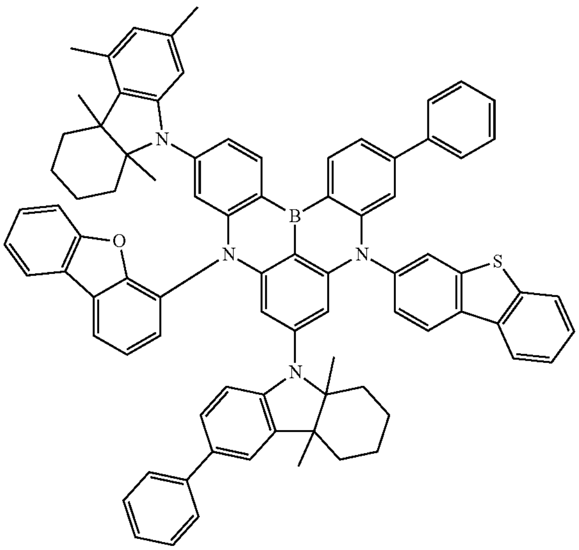
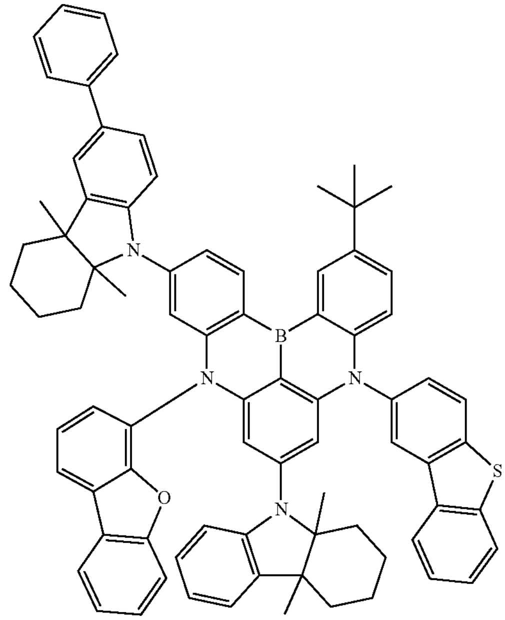
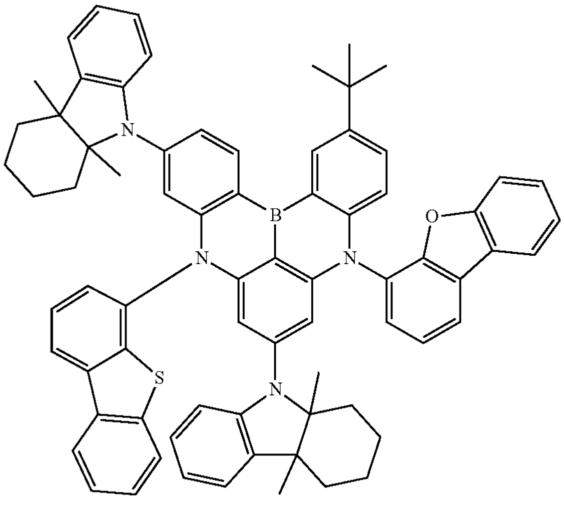
-continued
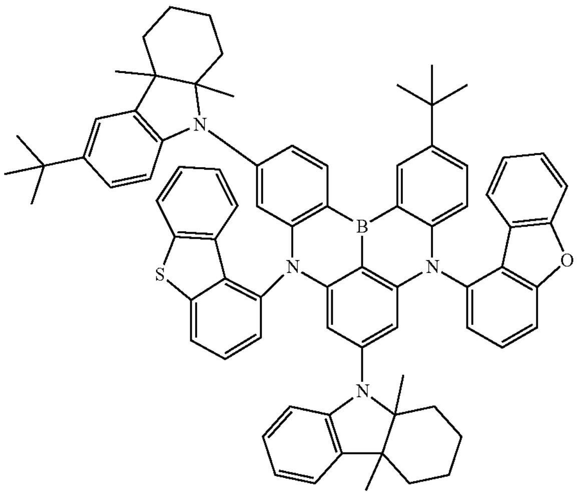
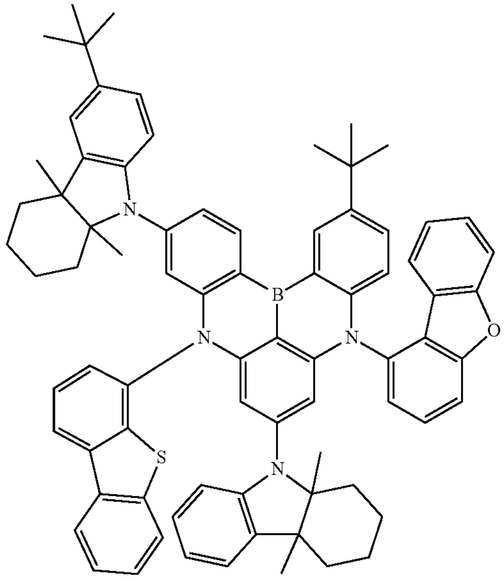

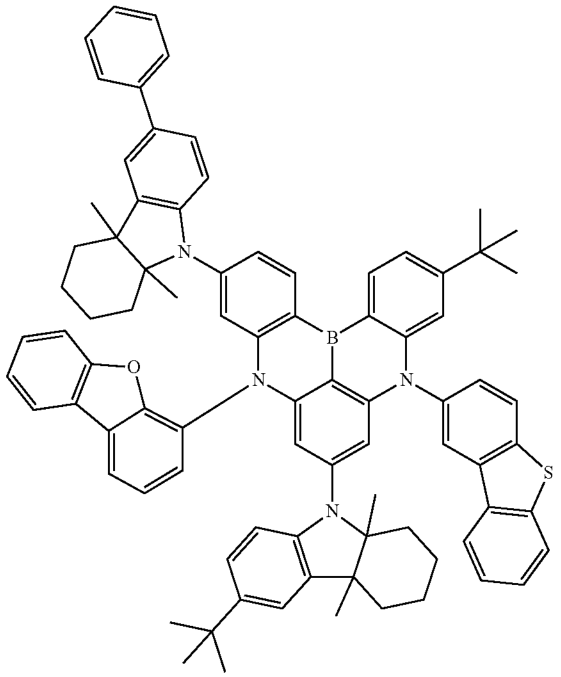
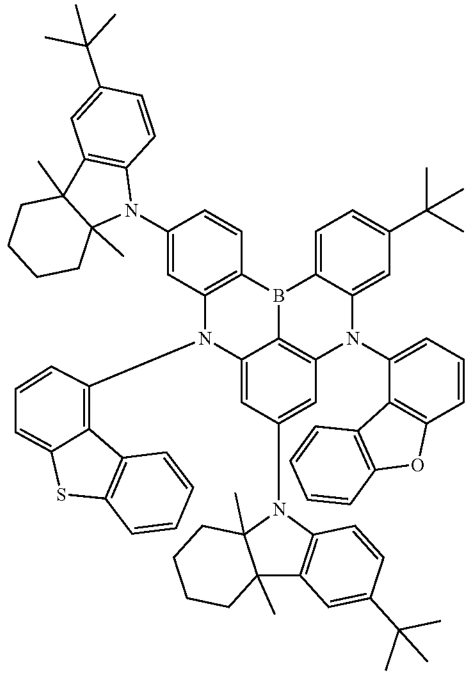
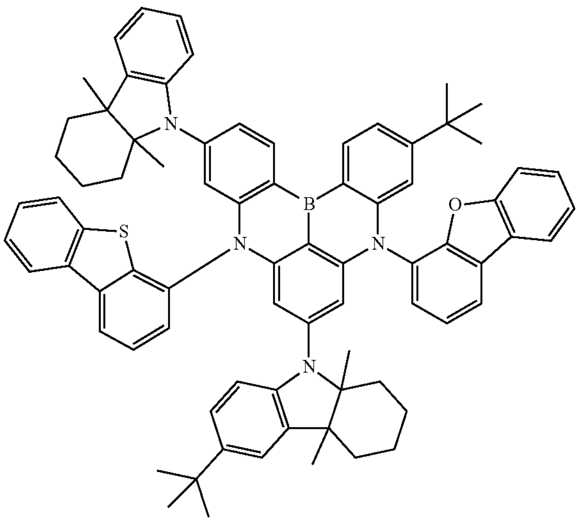
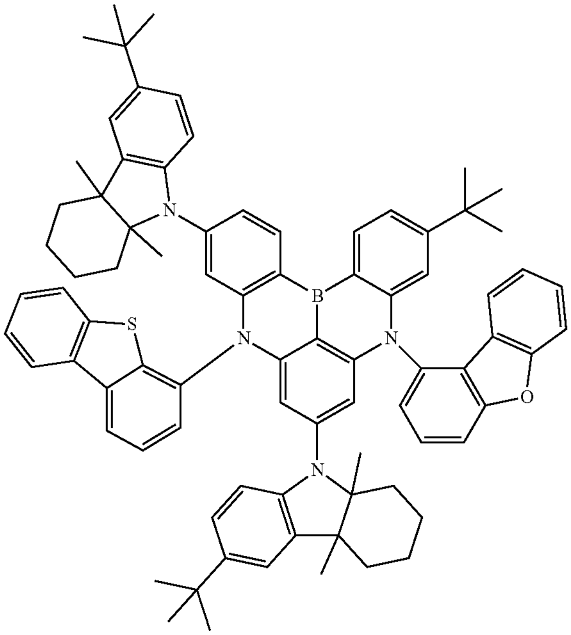

-continued
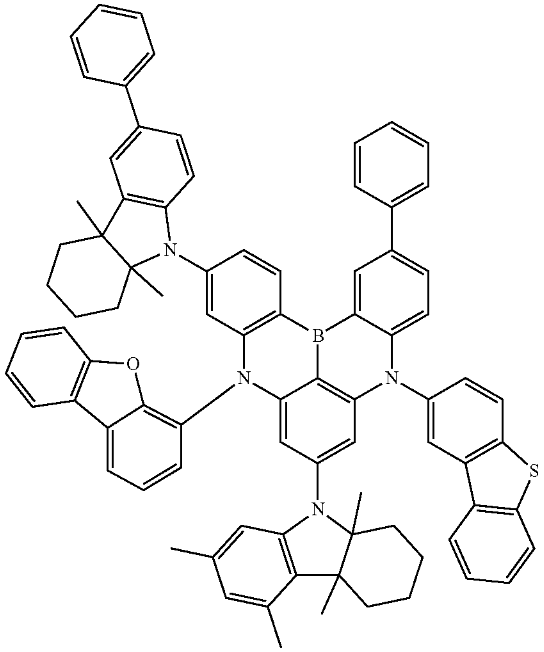
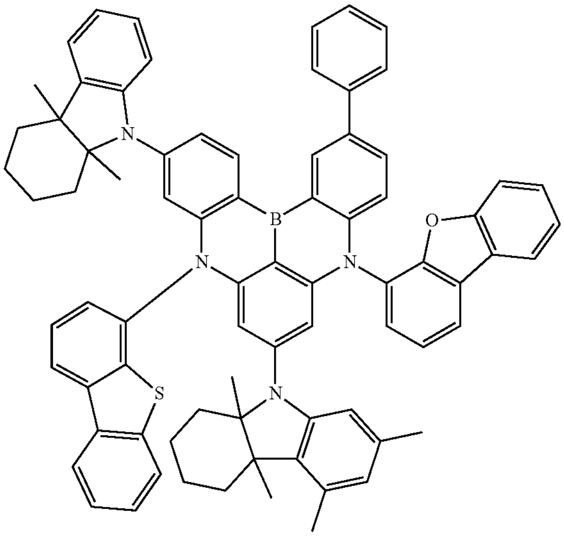
-continued
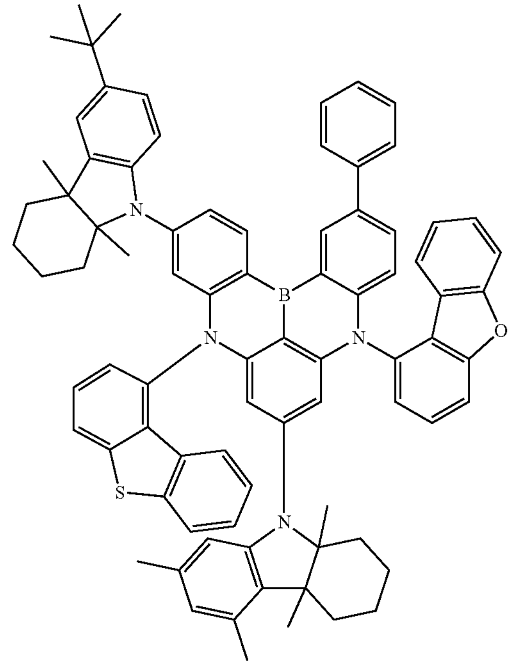
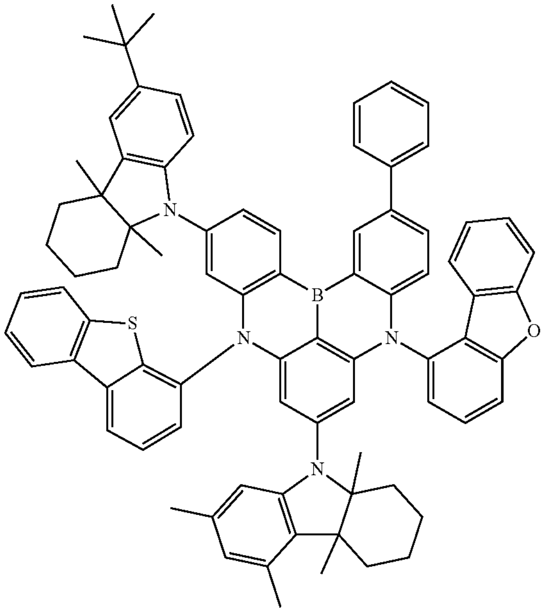

-continued
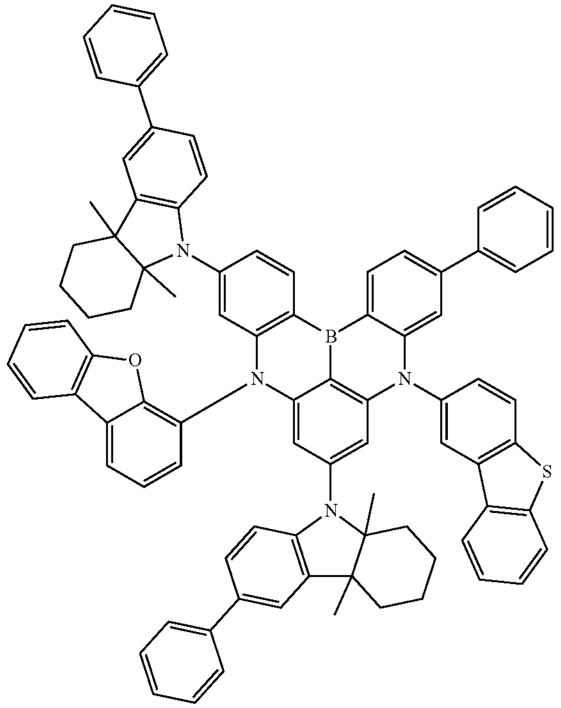
-continued
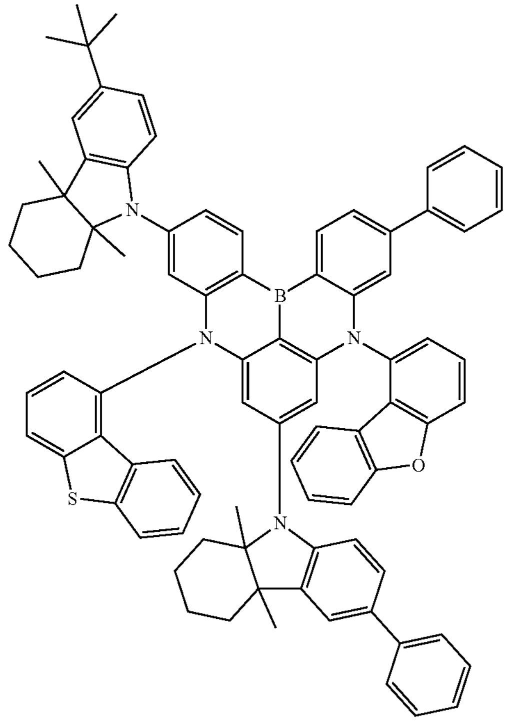
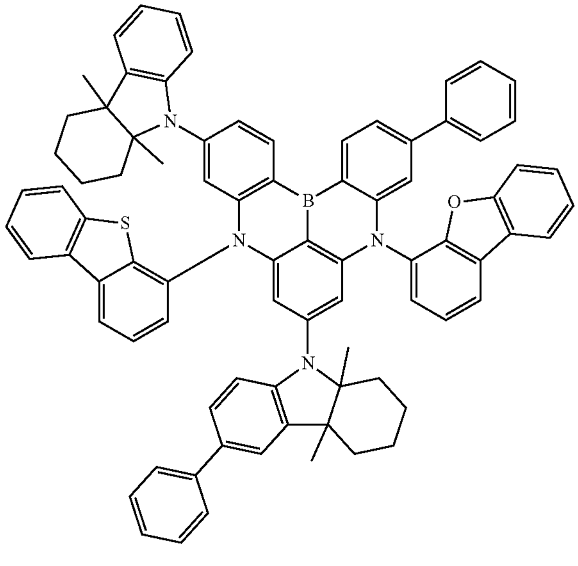
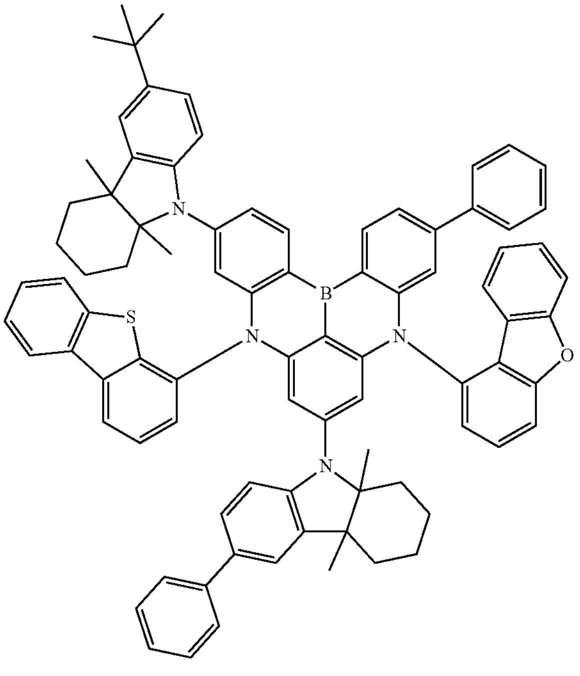

-continued
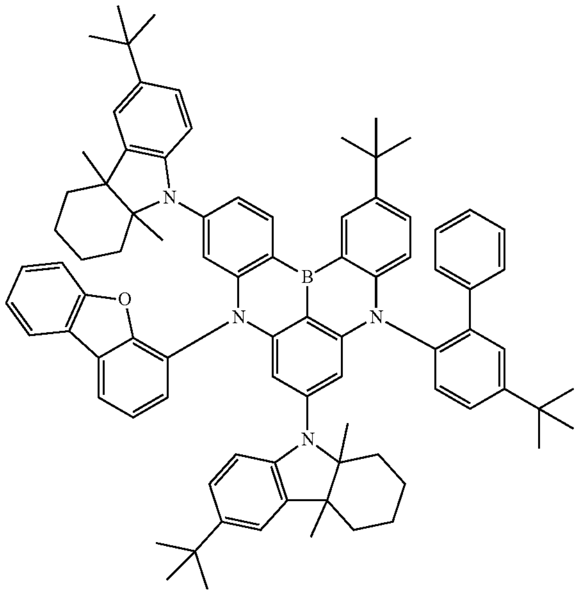
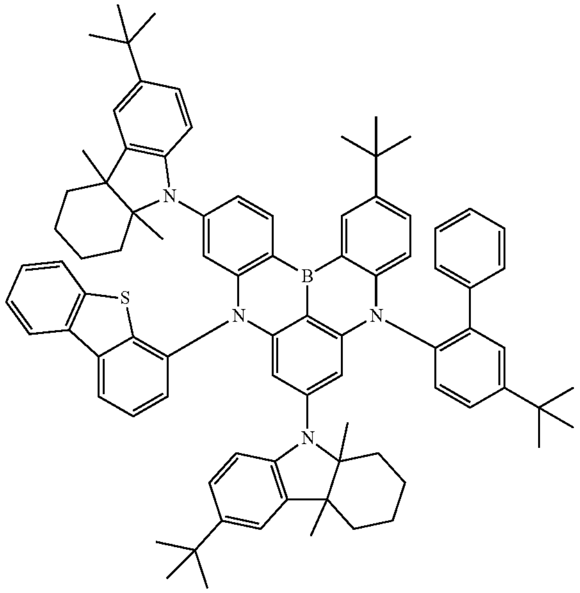
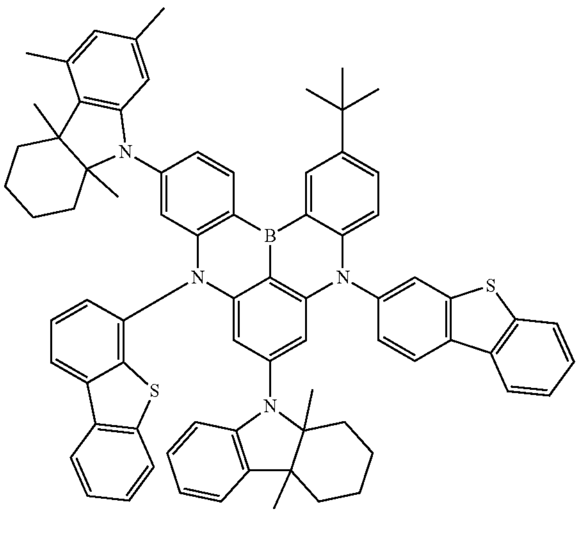
-continued
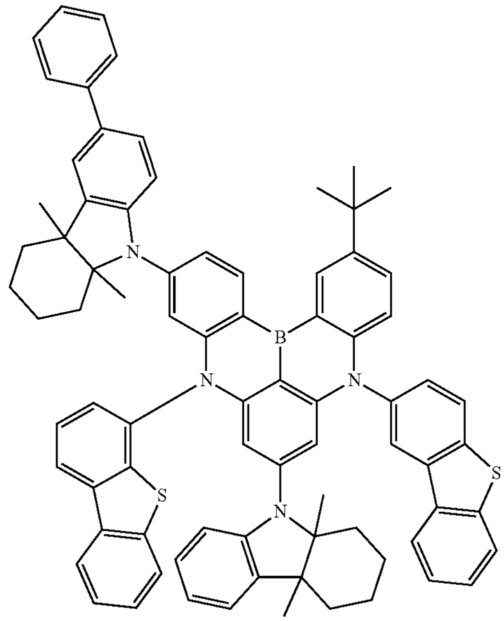
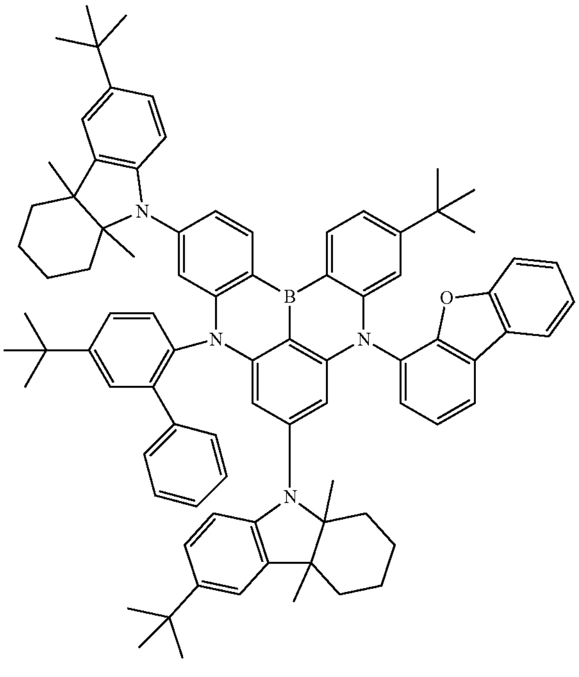

-continued
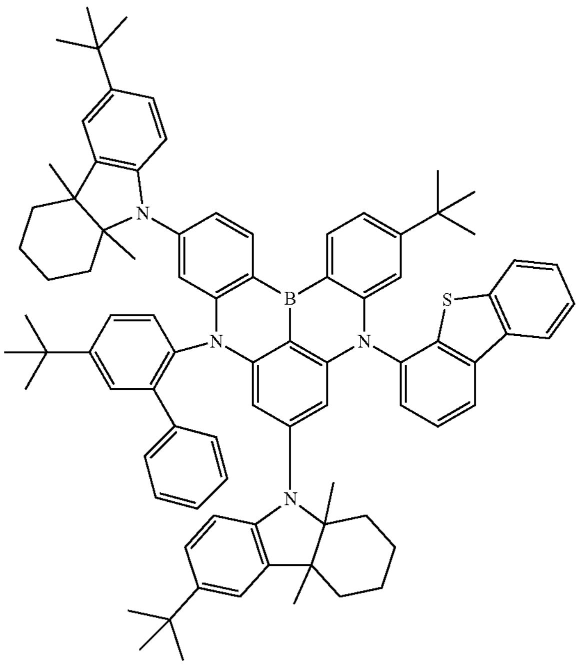
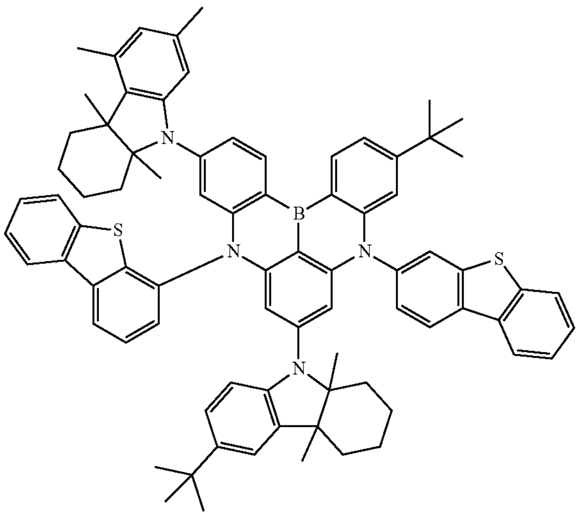
-continued
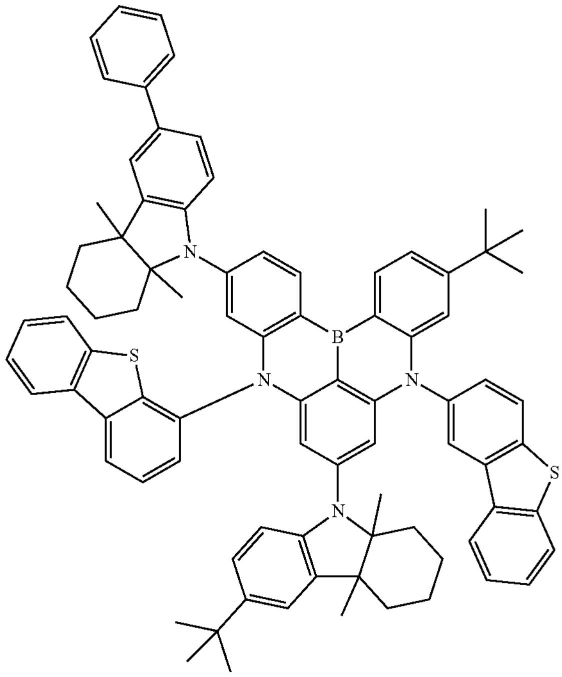
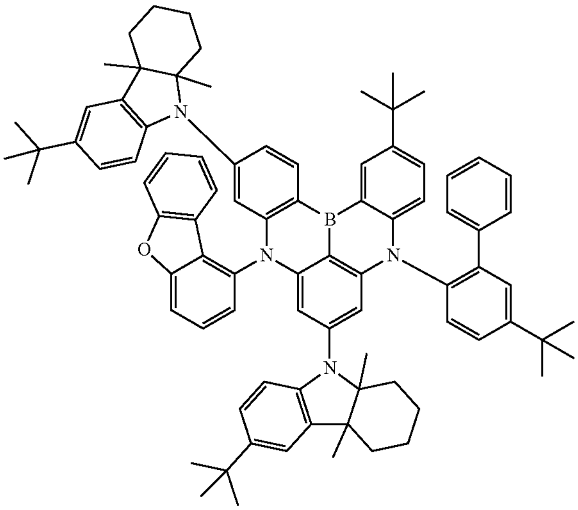
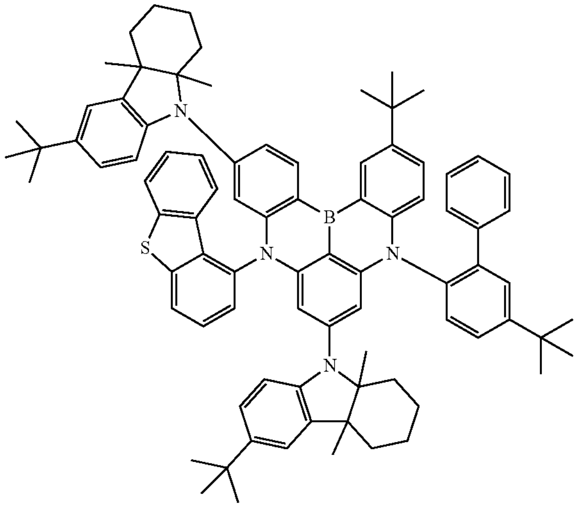

-continued
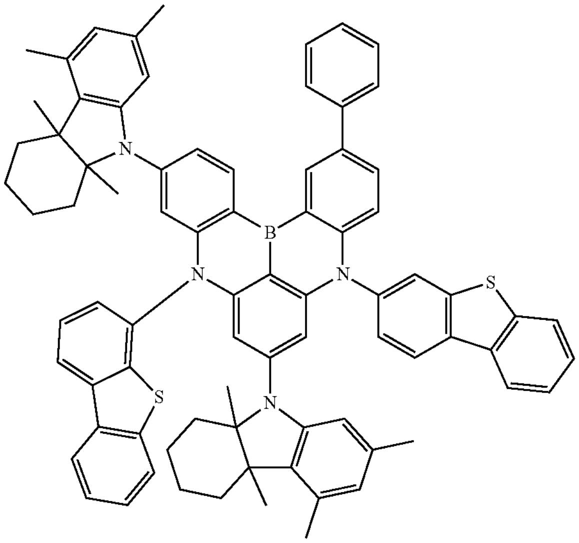
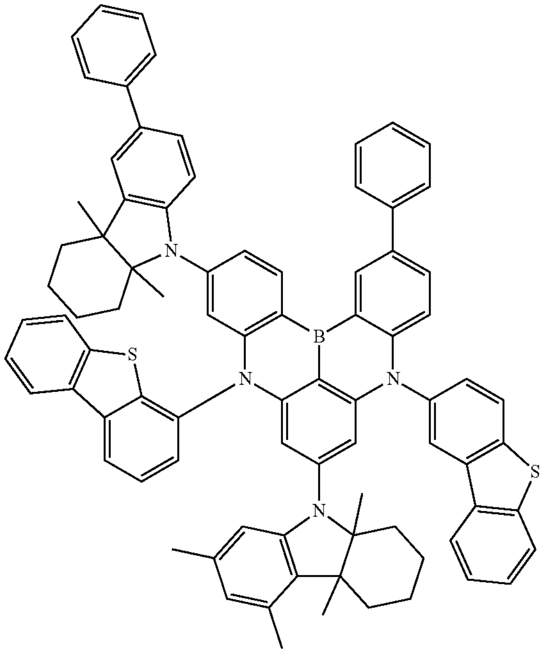
-continued
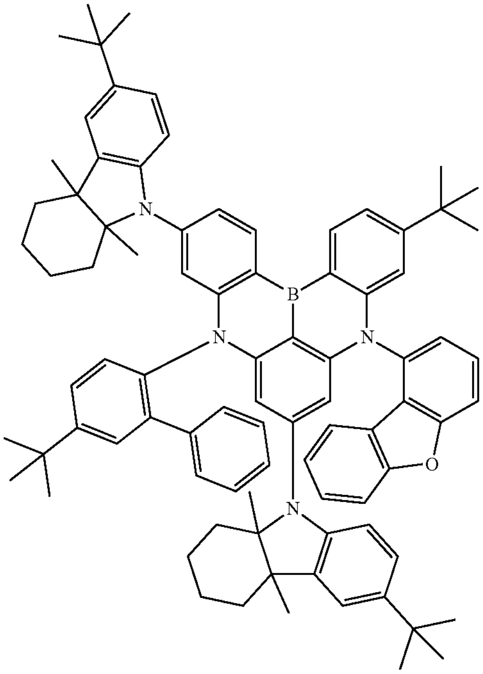
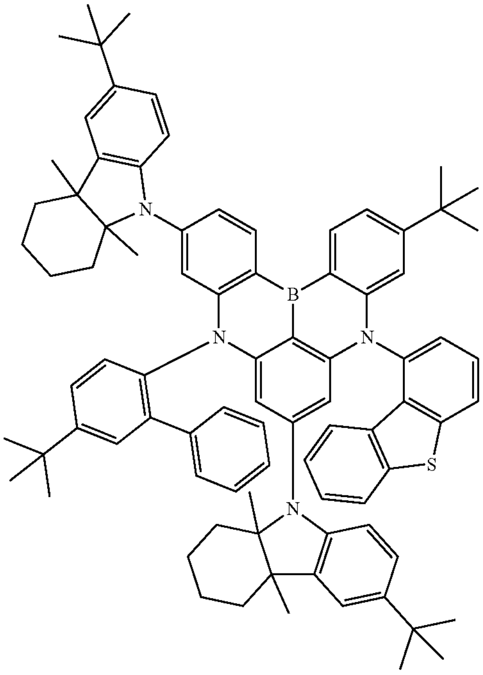

-continued
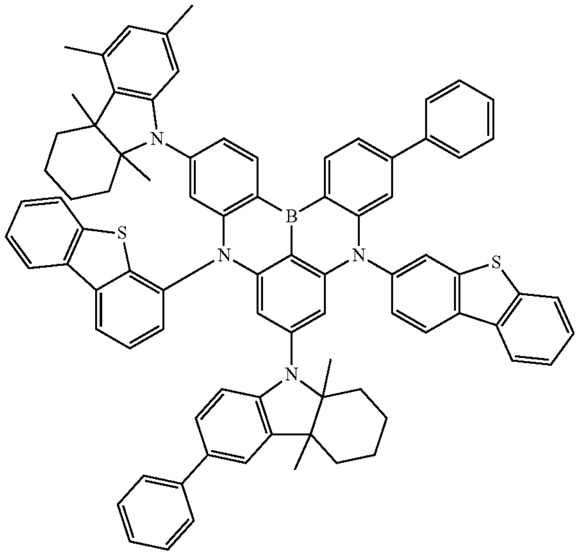
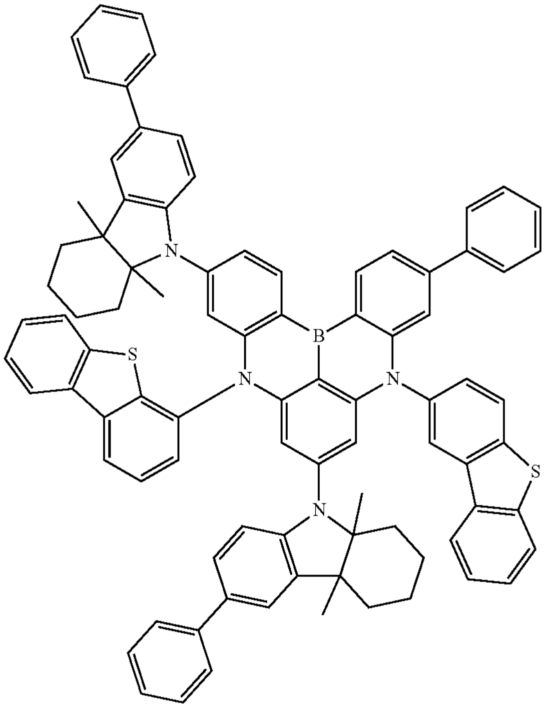
-continued
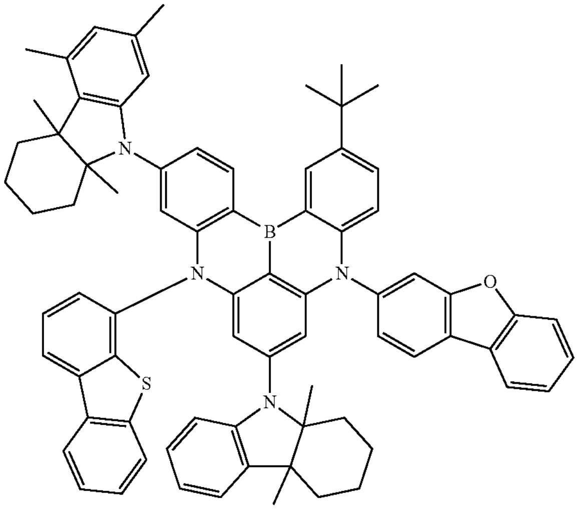
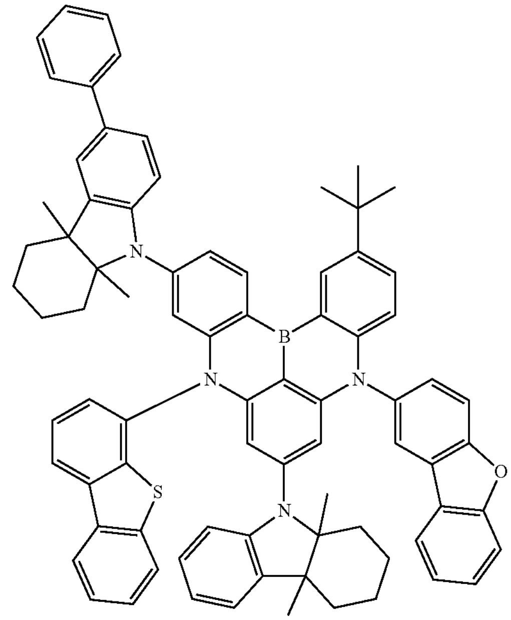
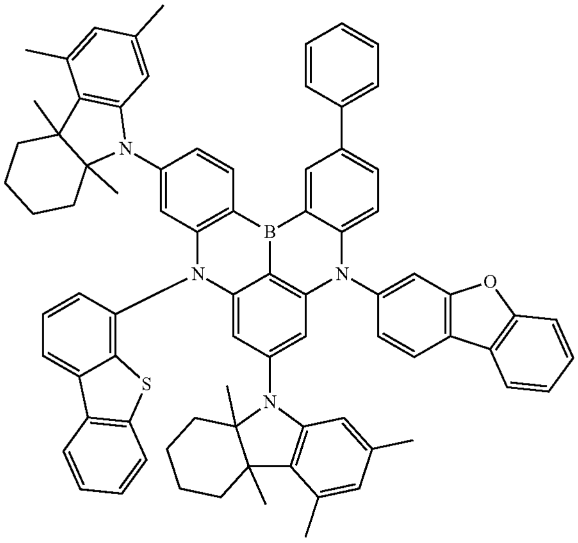

-continued
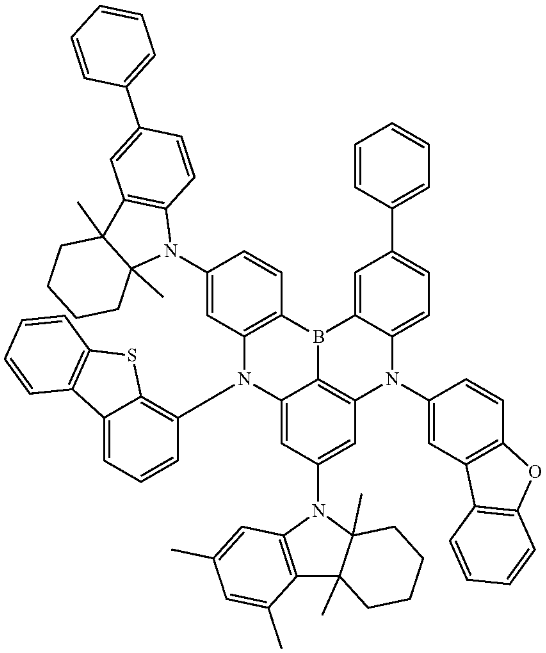
-continued
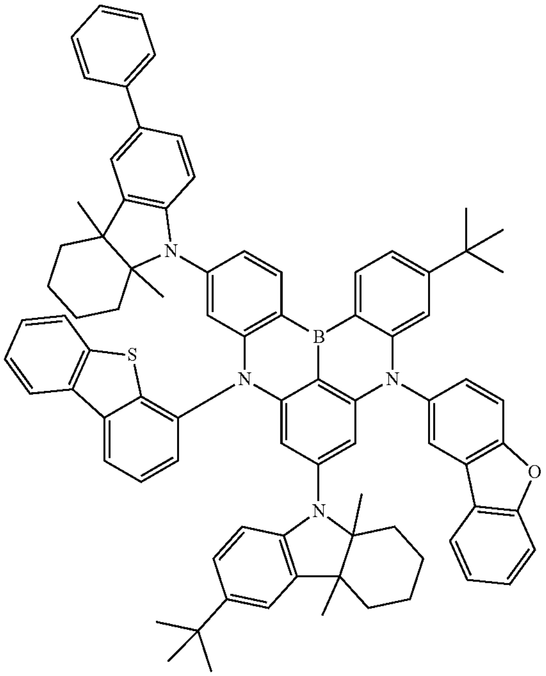
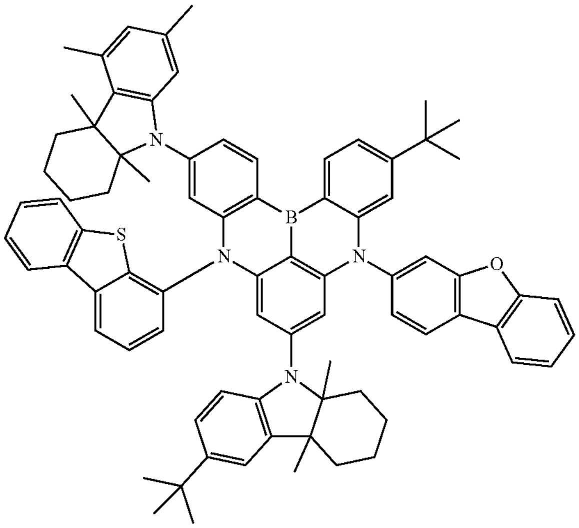
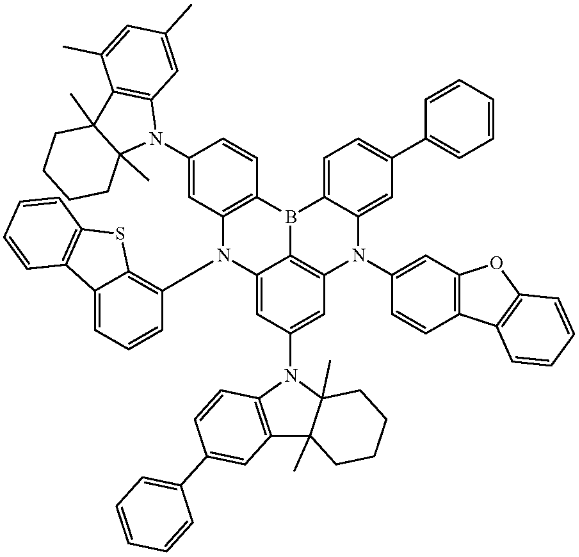

-continued
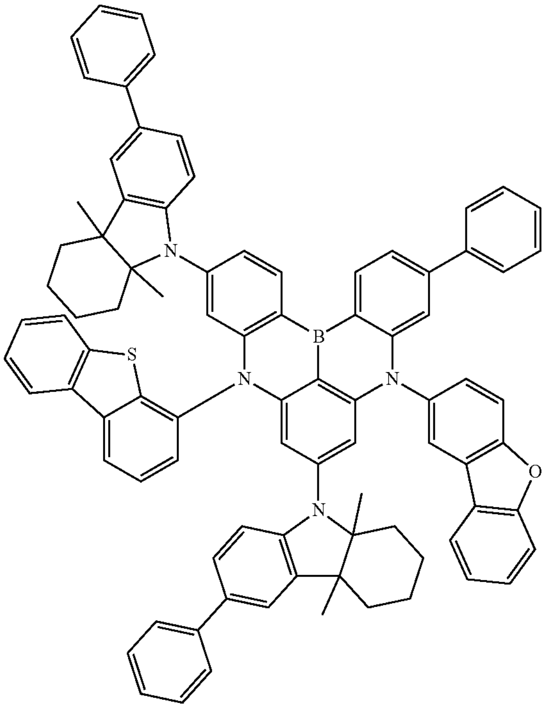
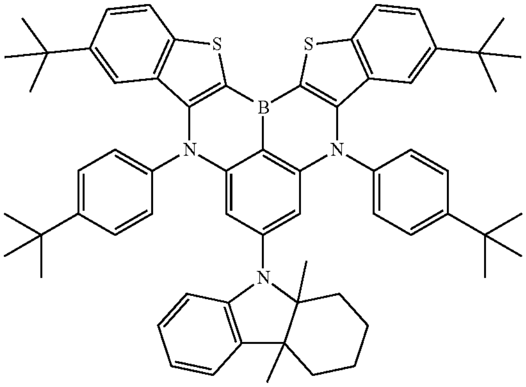
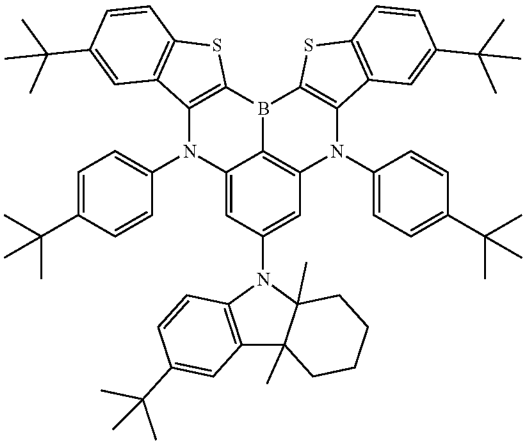
-continued
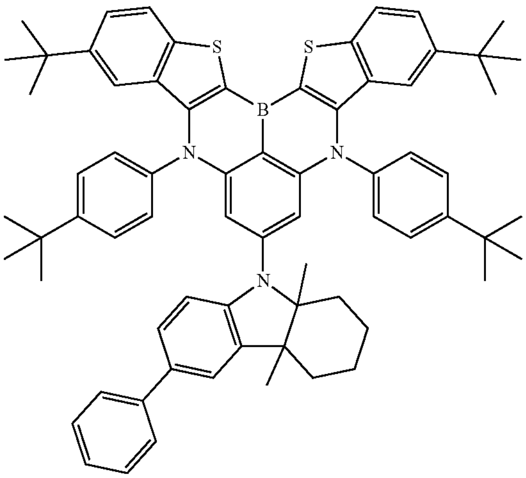
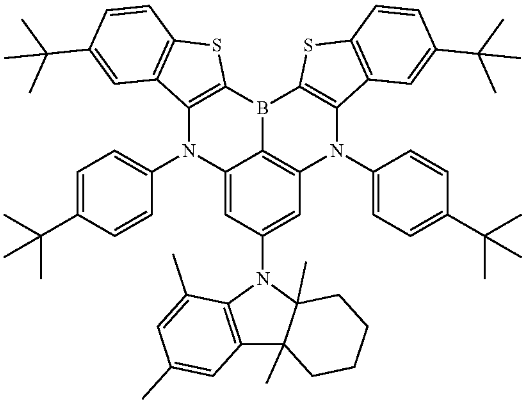
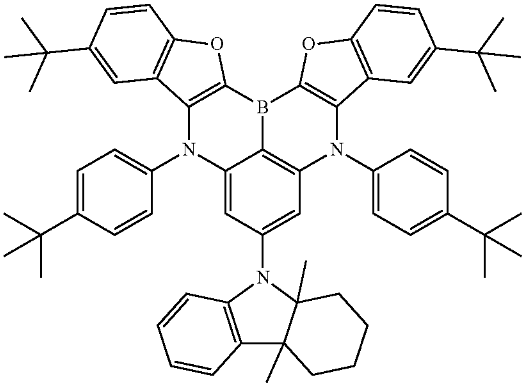
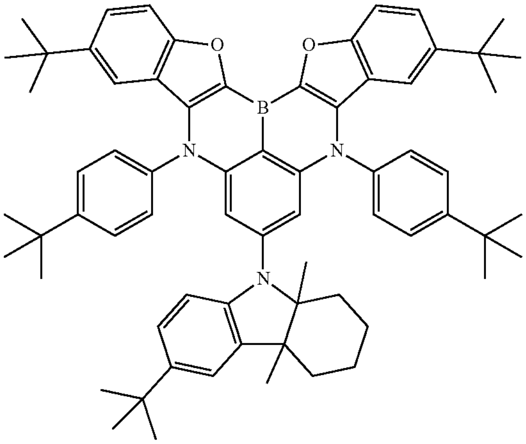

-continued
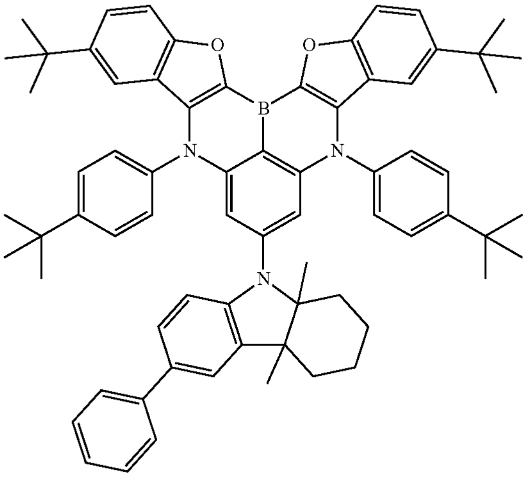
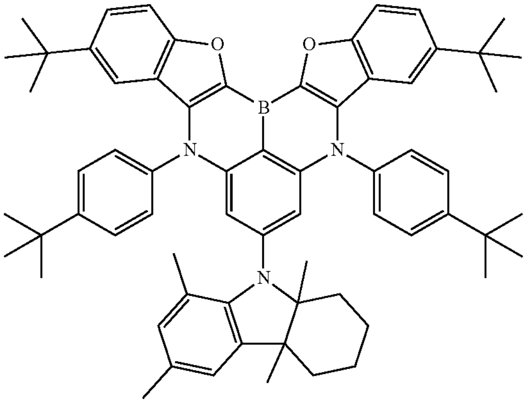
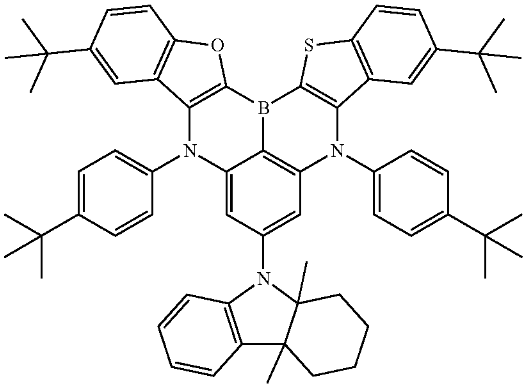
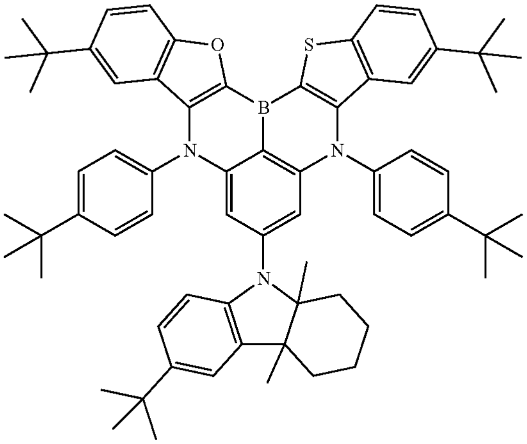
-continued
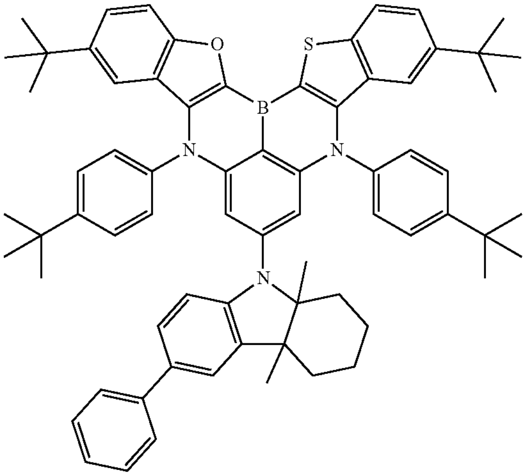
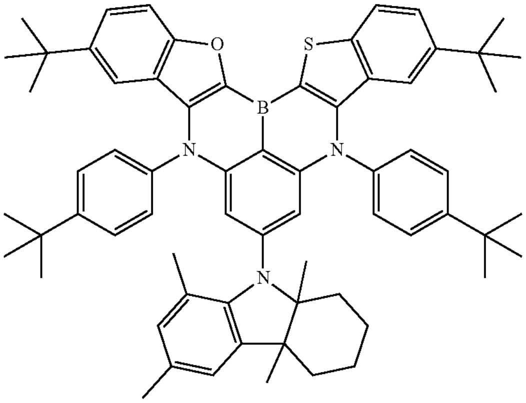
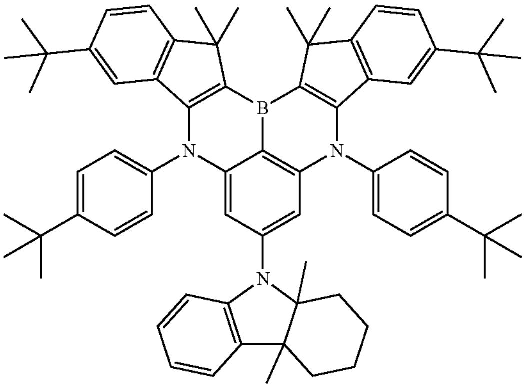
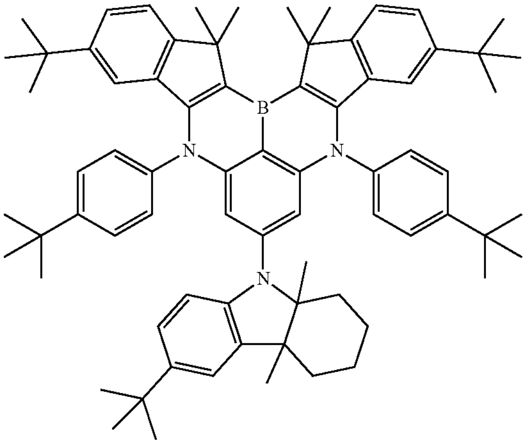

-continued
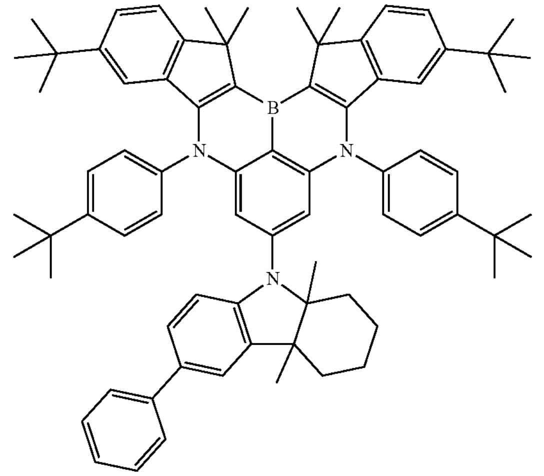
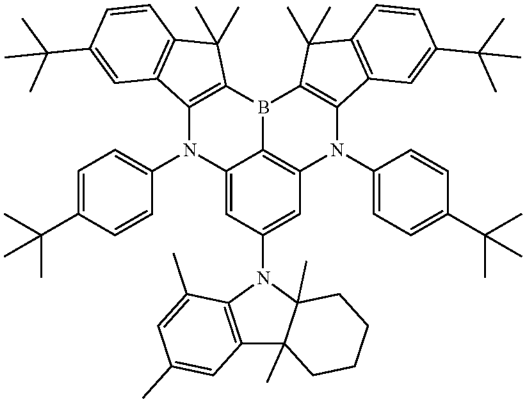
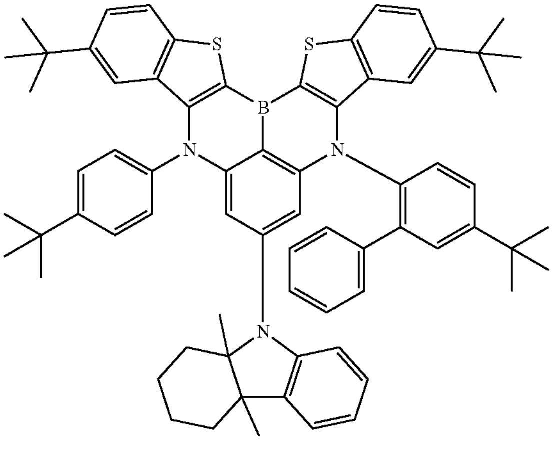
-continued
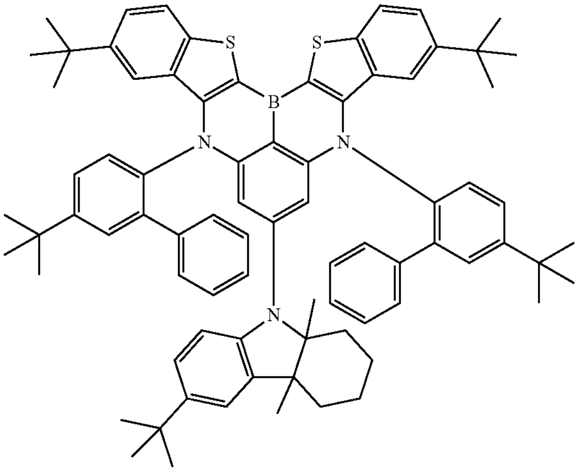
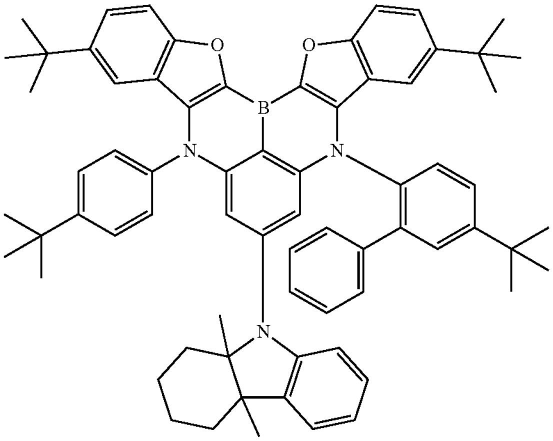
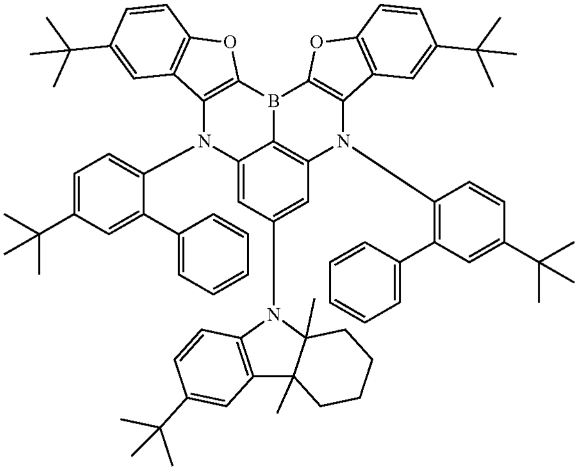

-continued
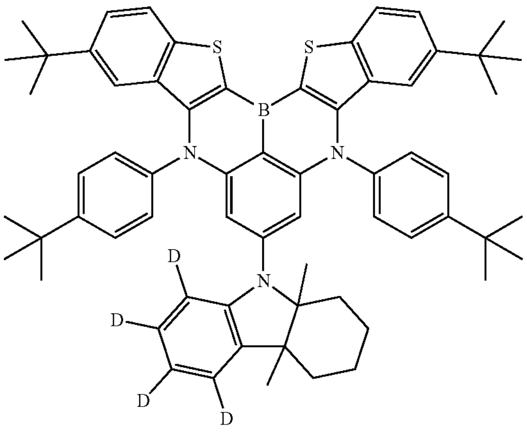
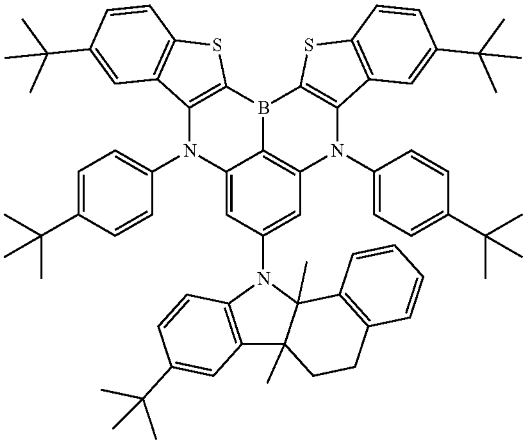
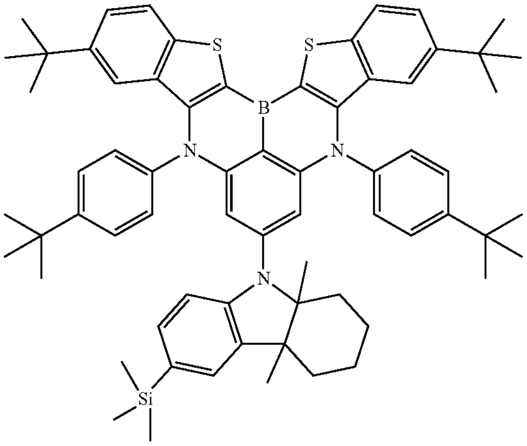
-continued
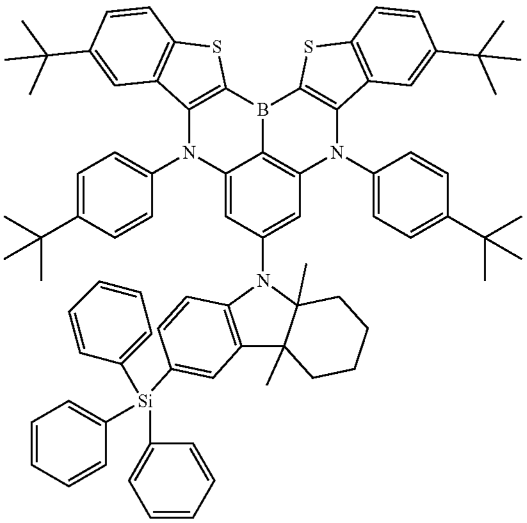
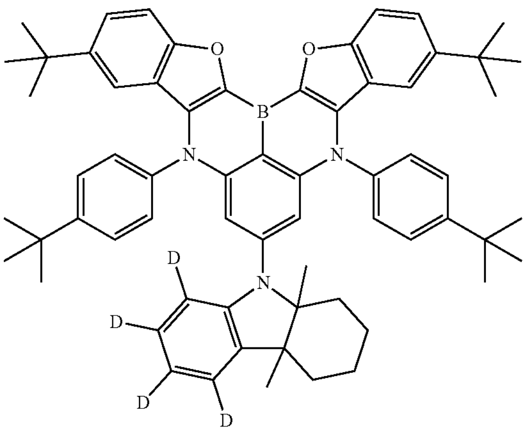
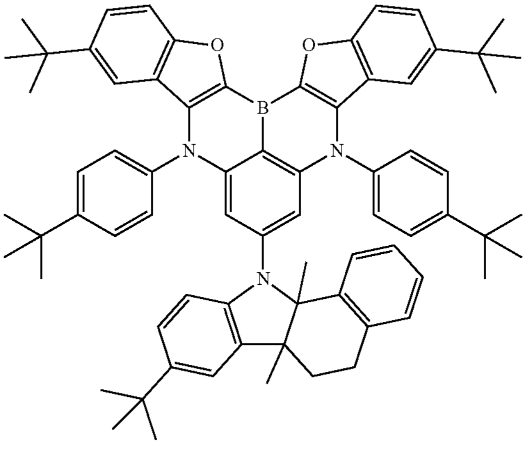

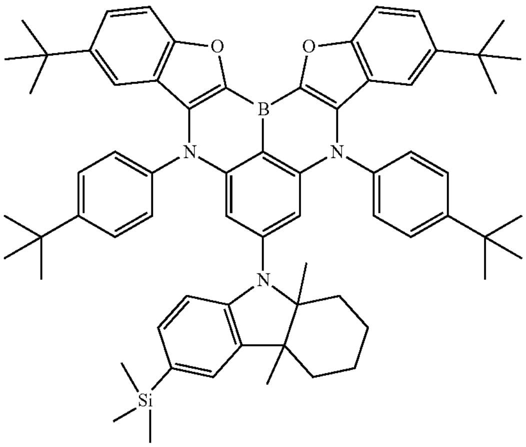
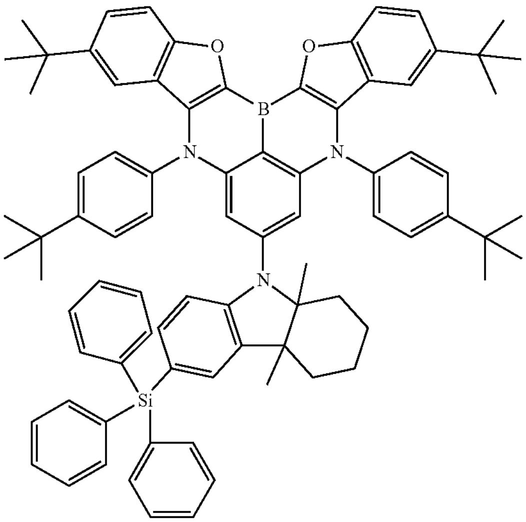
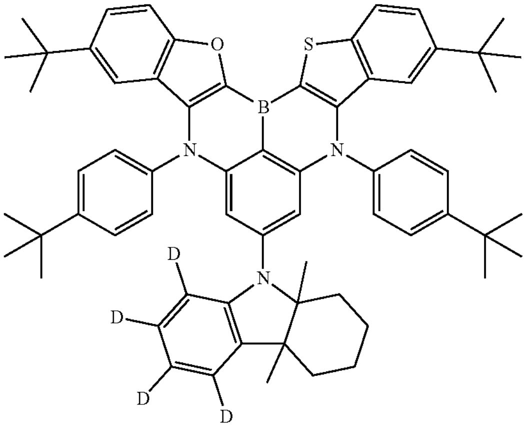
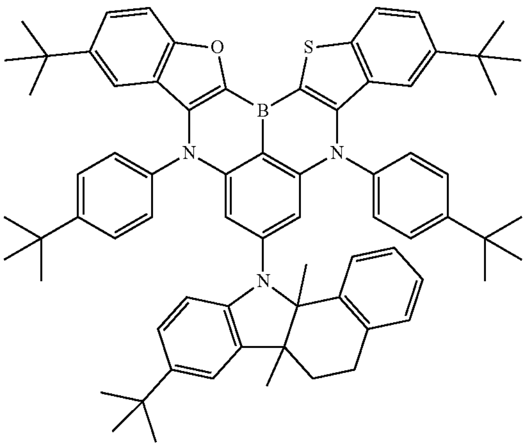
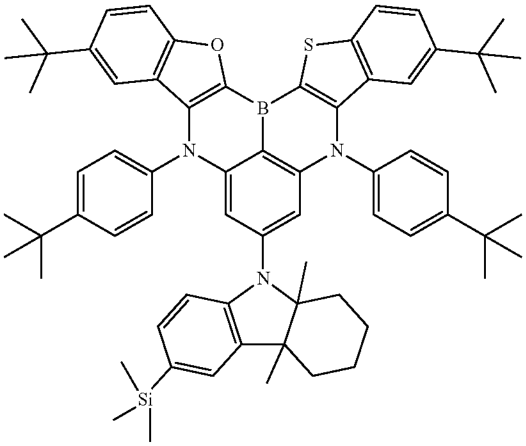
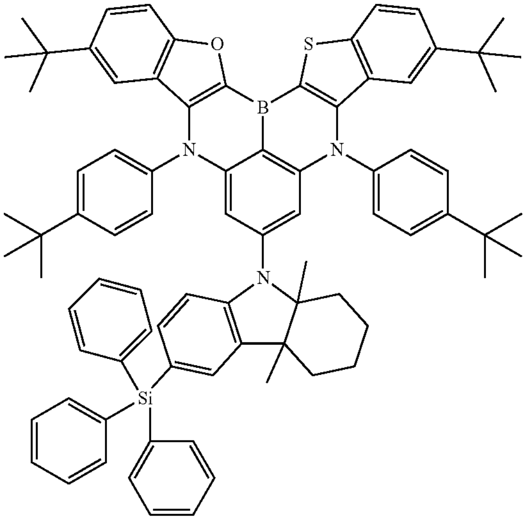

-continued
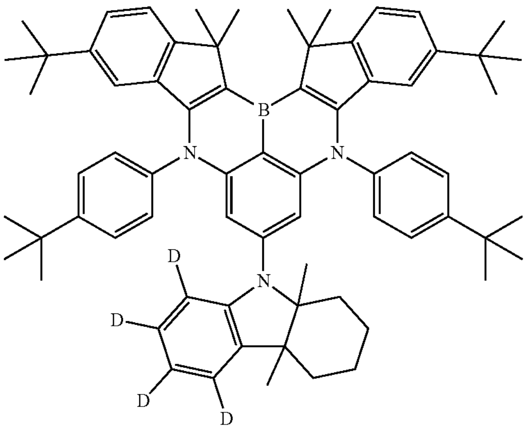
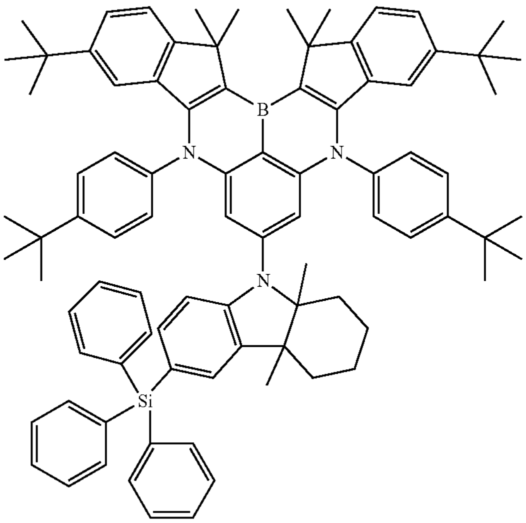
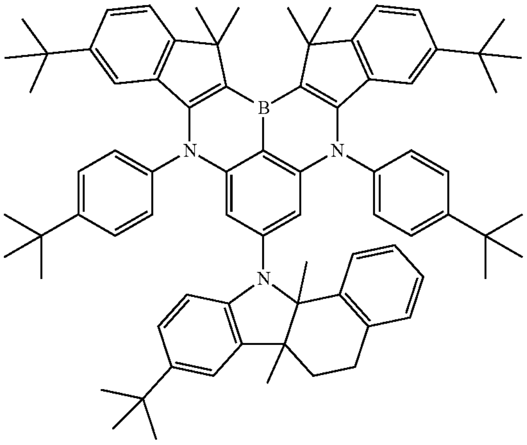
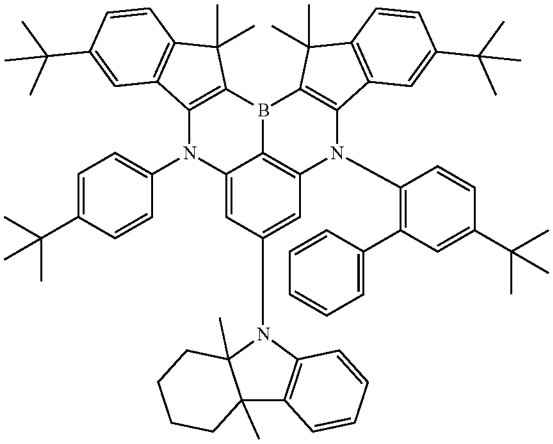
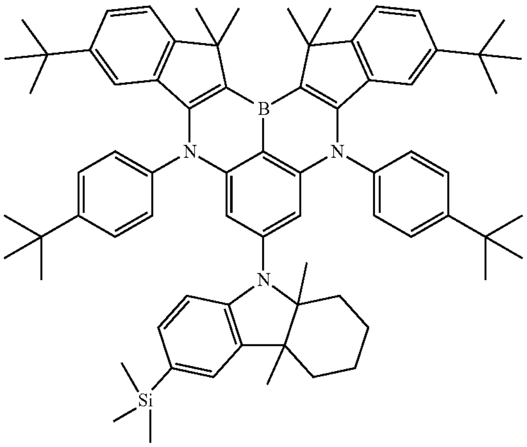
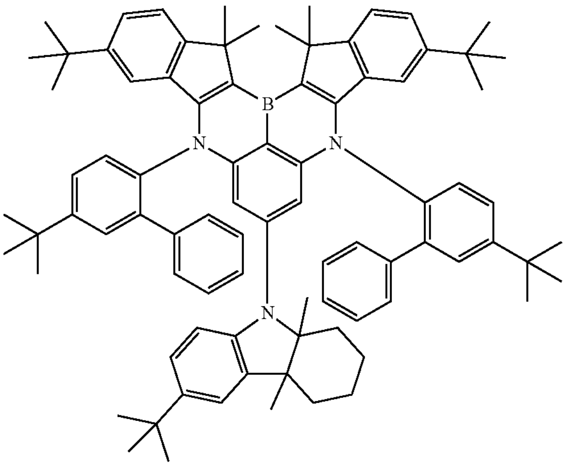
-continued

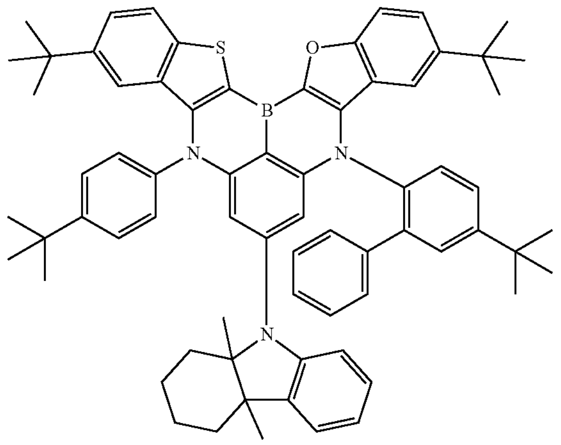
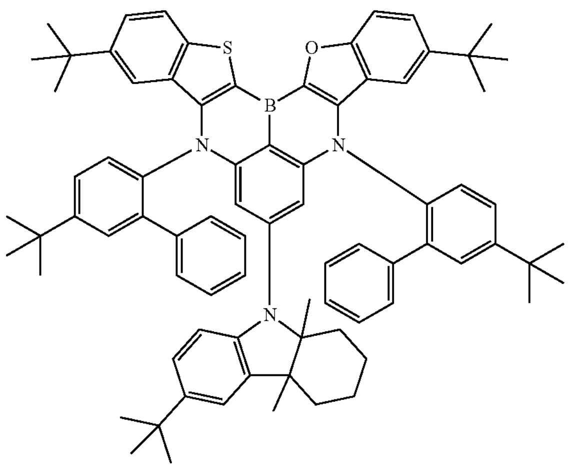
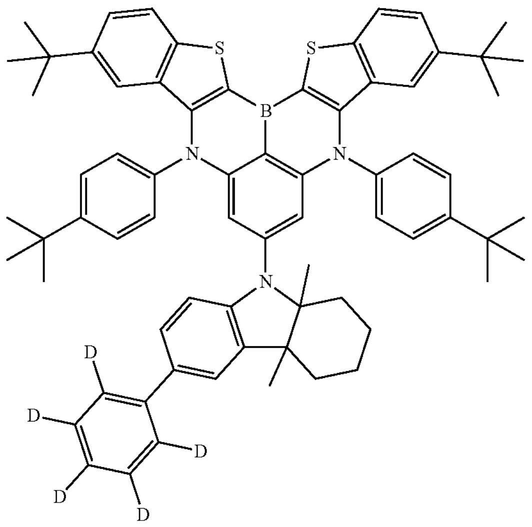
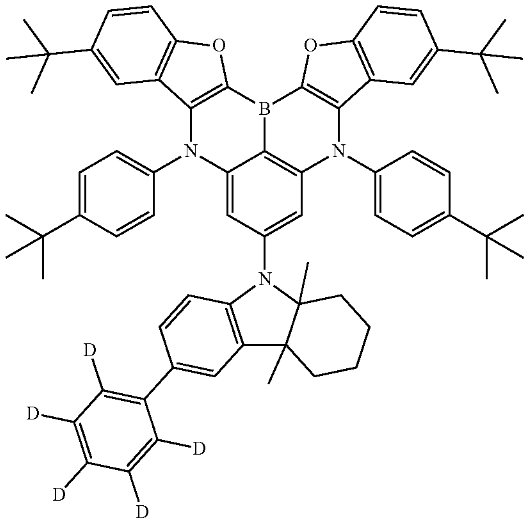
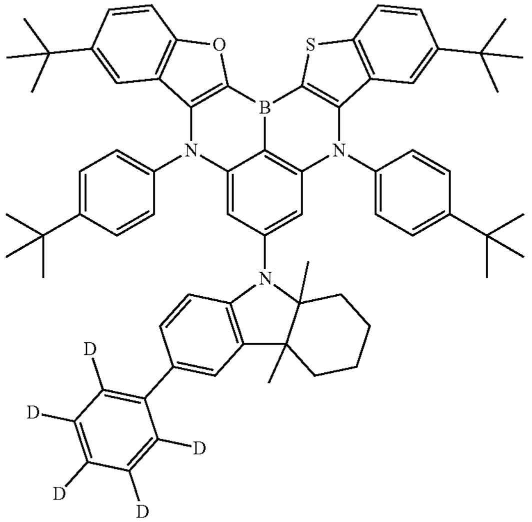
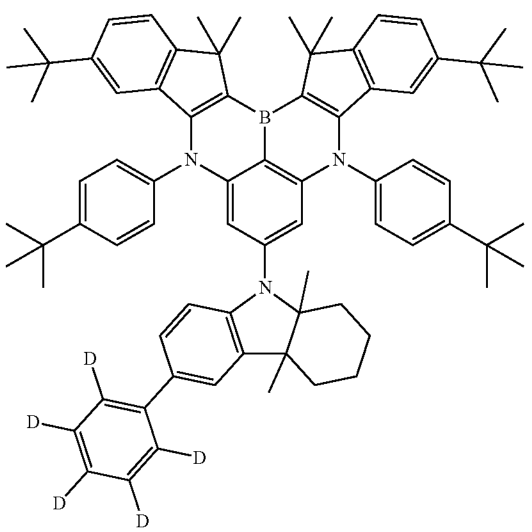

-continued
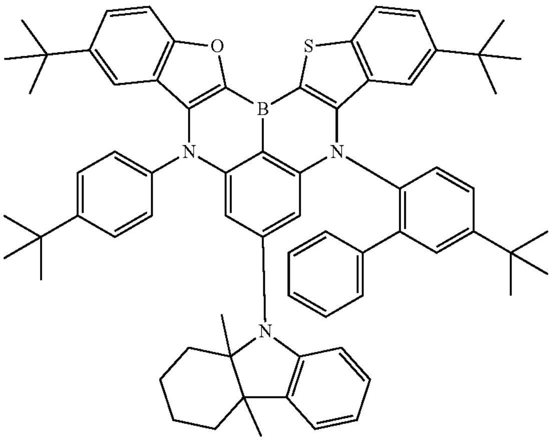
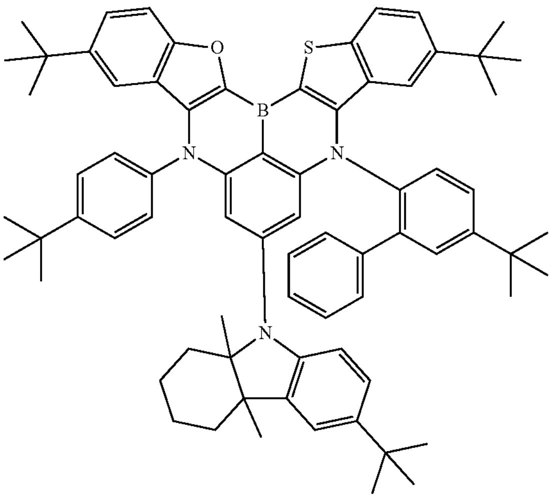
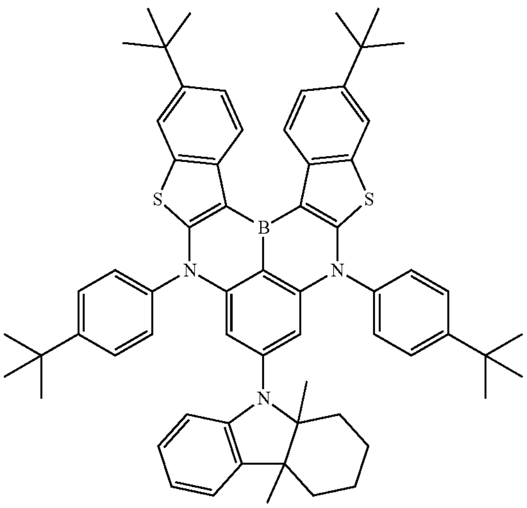
-continued
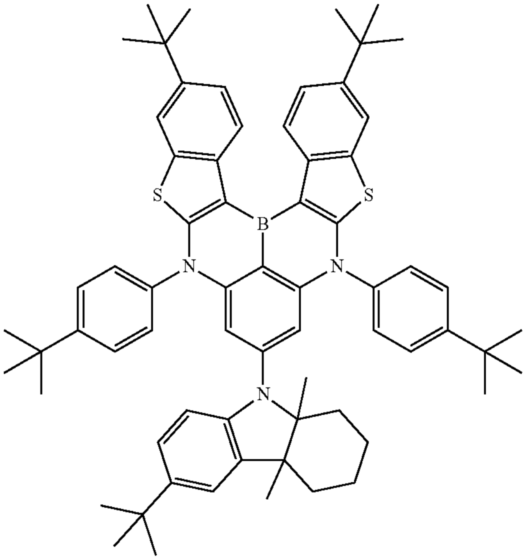
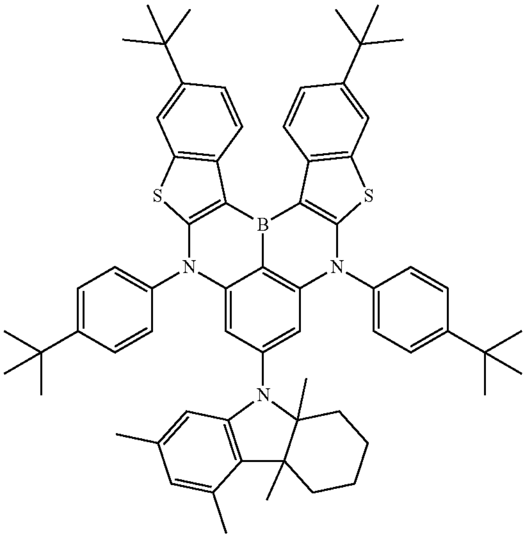
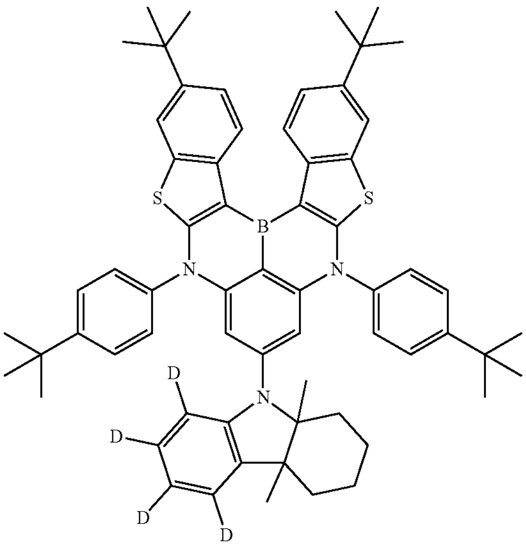

-continued
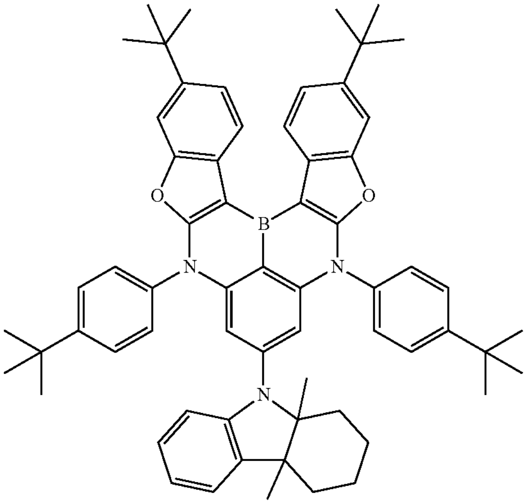
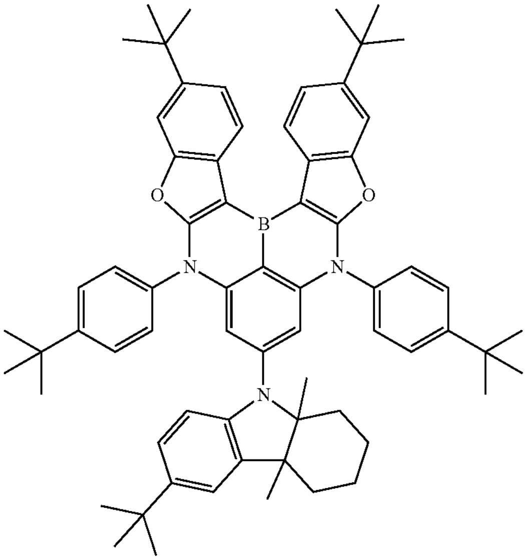
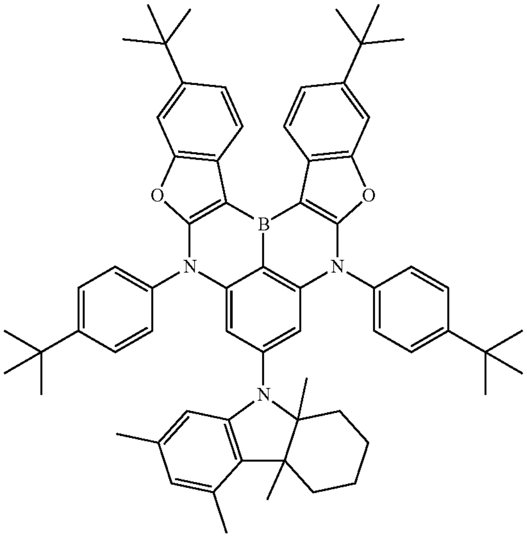
-continued
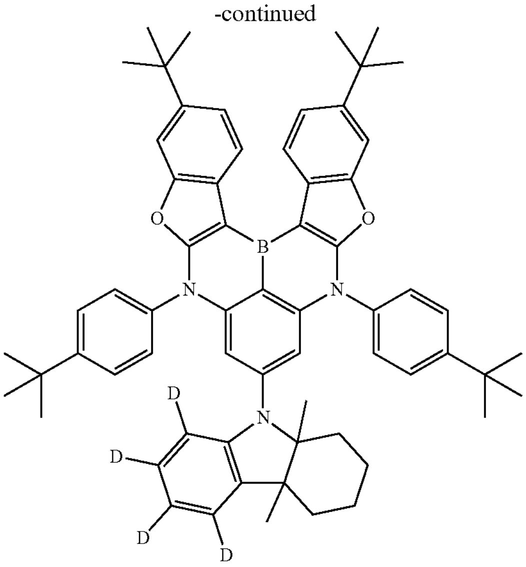
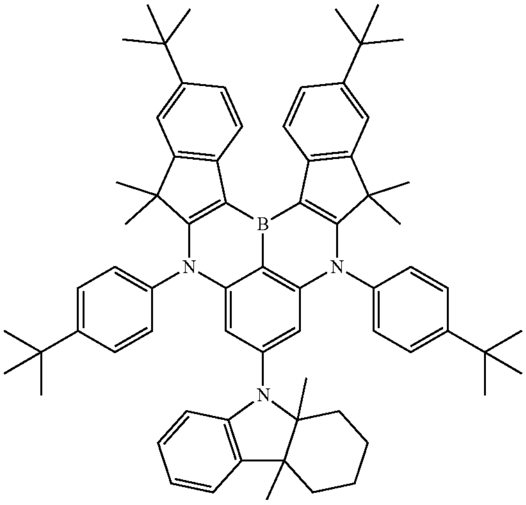
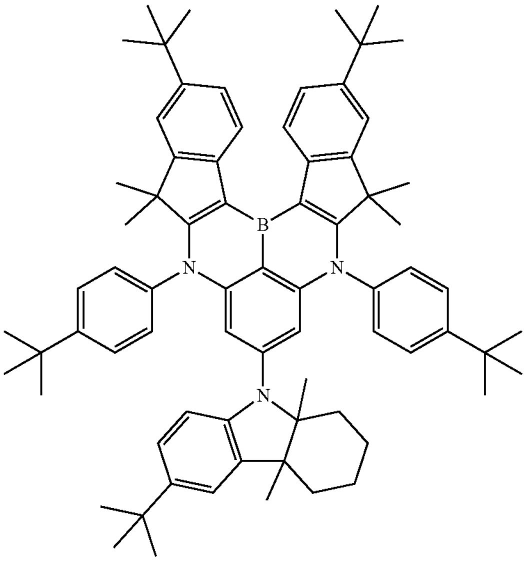

-continued
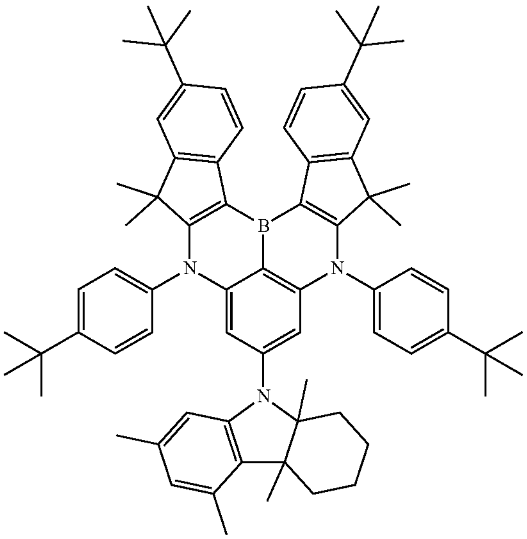
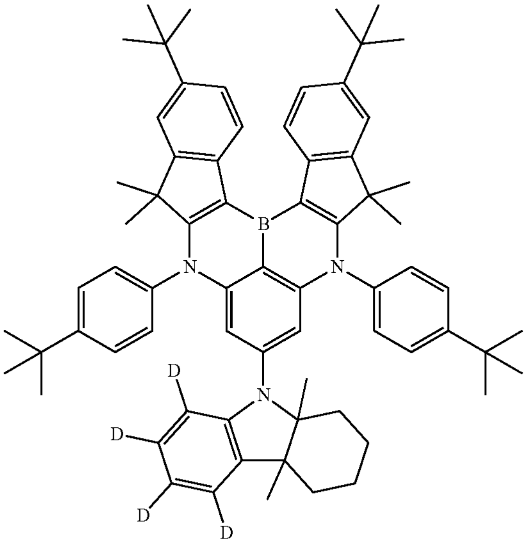
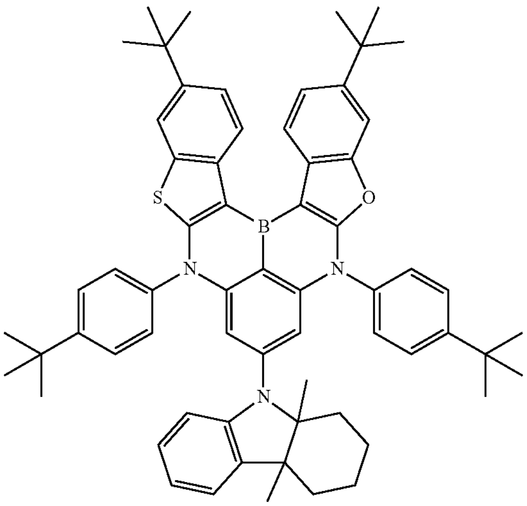
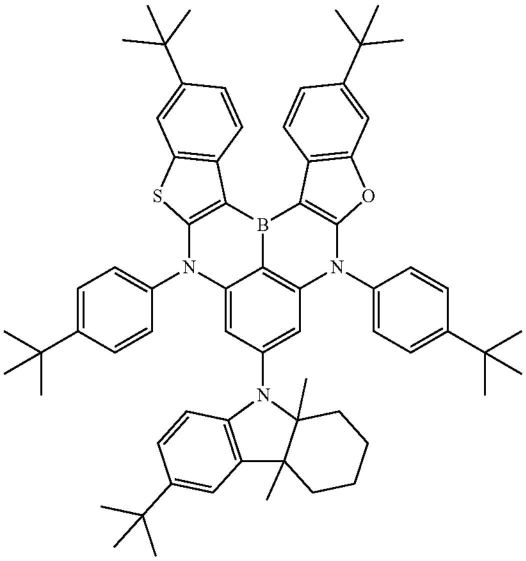
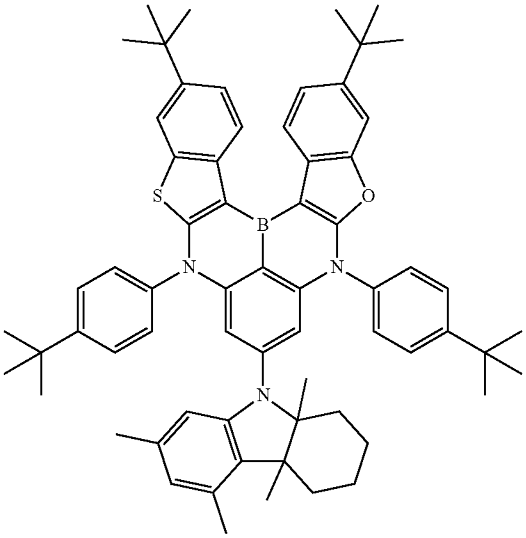
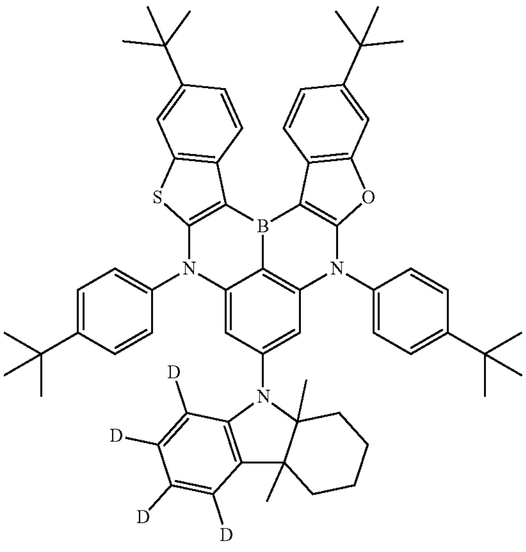
-continued -continued
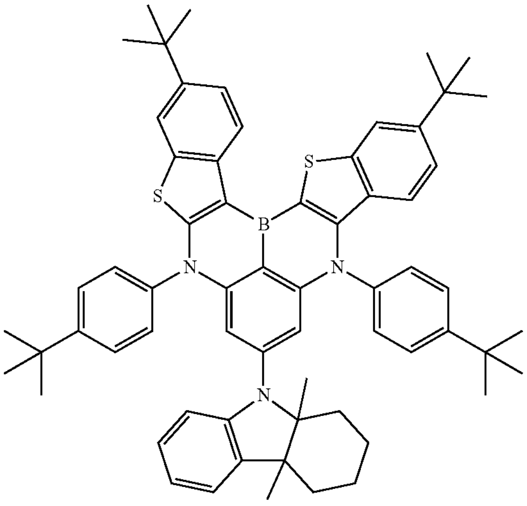
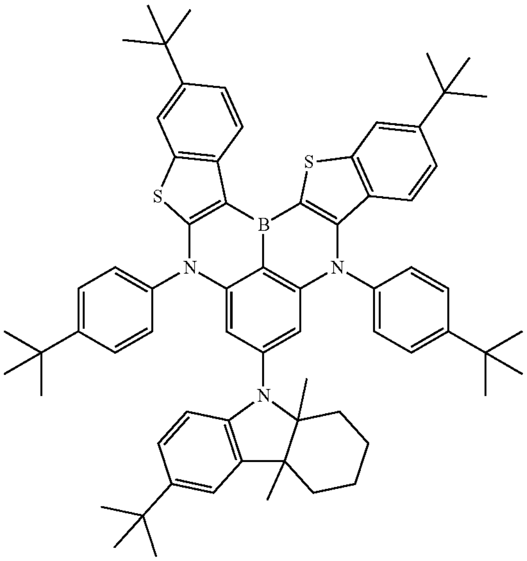
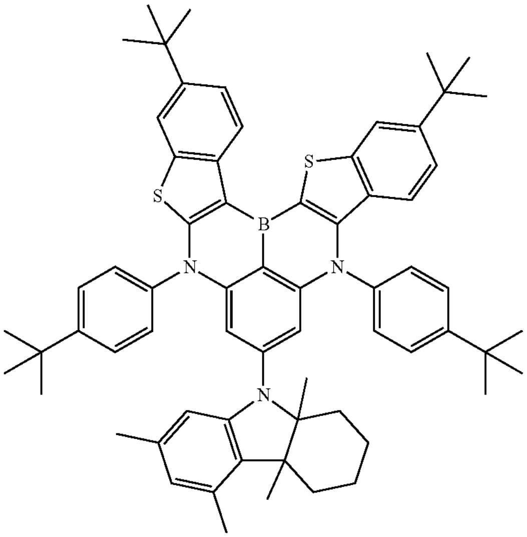
-continued
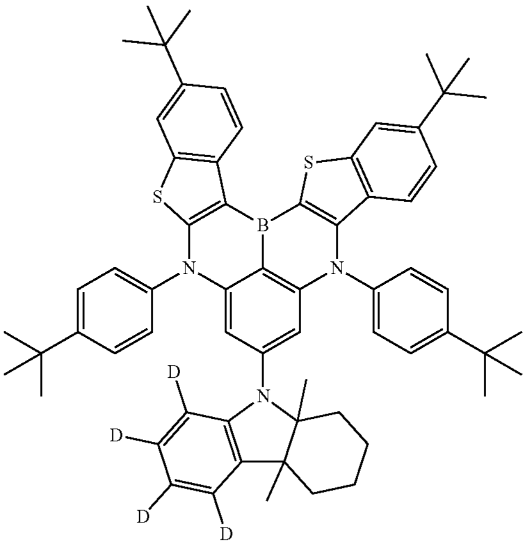
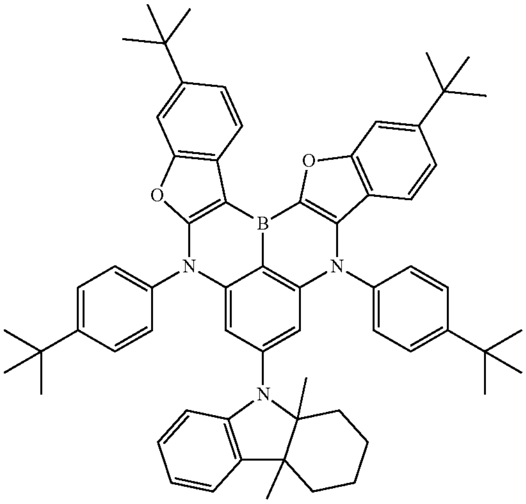
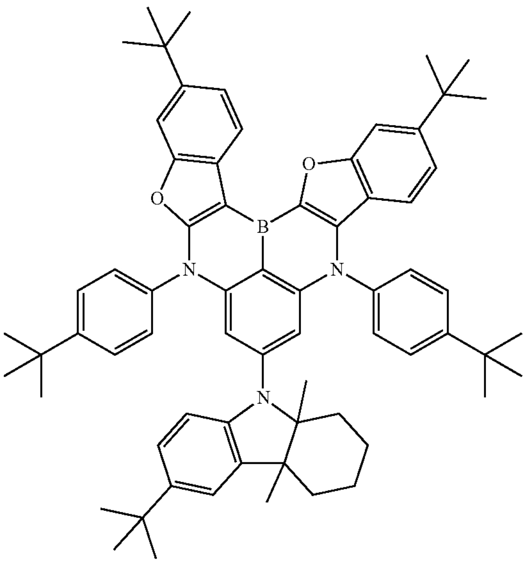

-continued
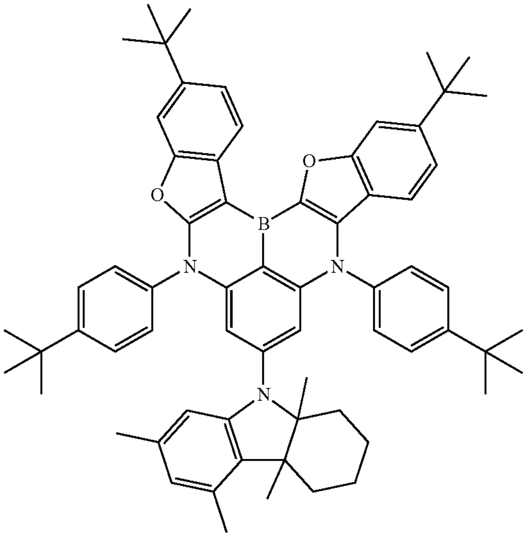
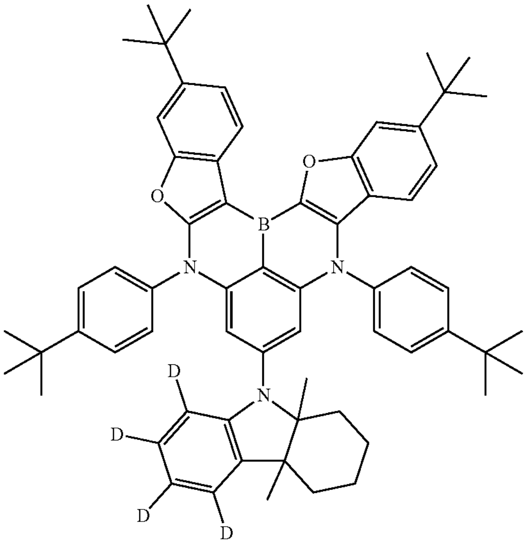
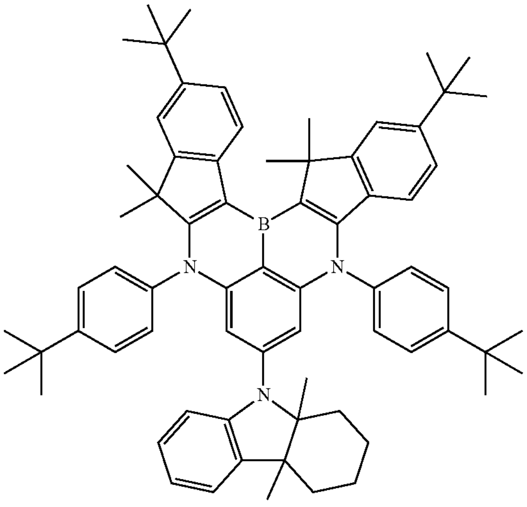
-continued
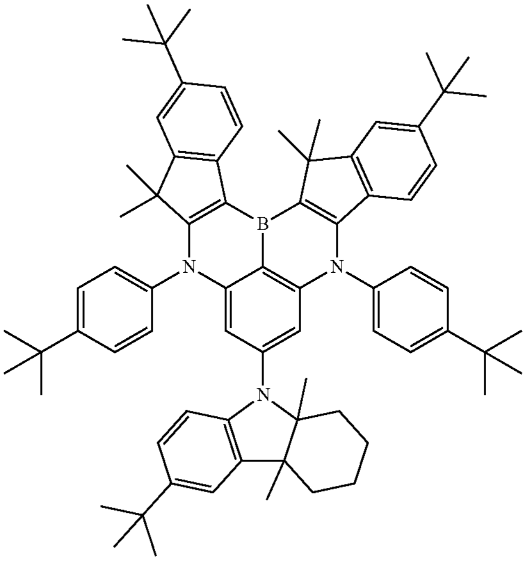
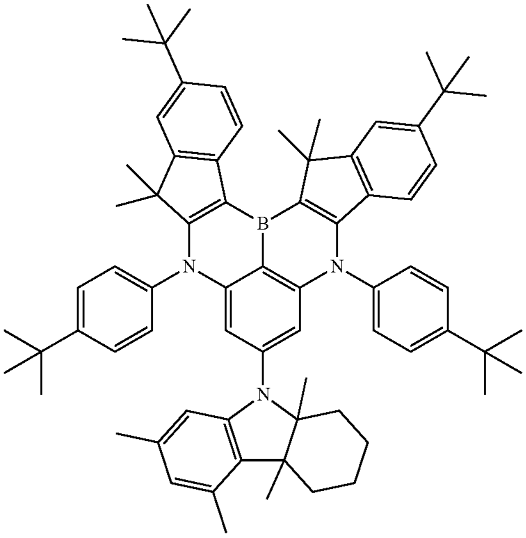
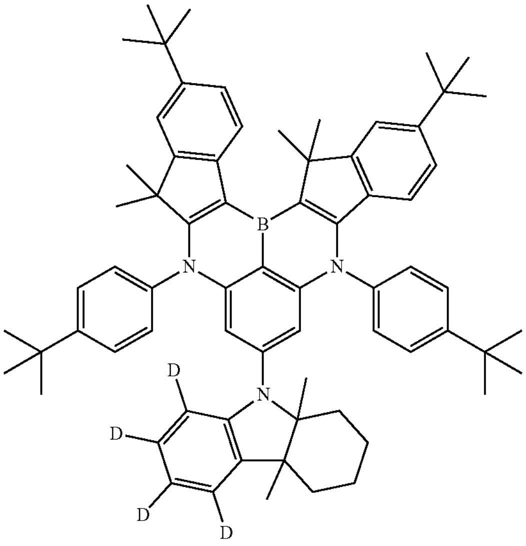

-continued
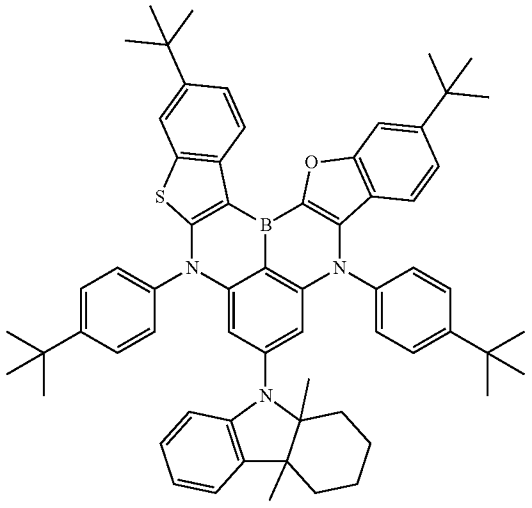
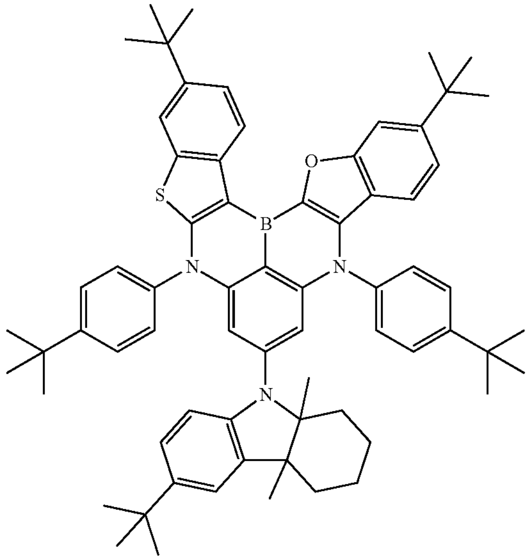
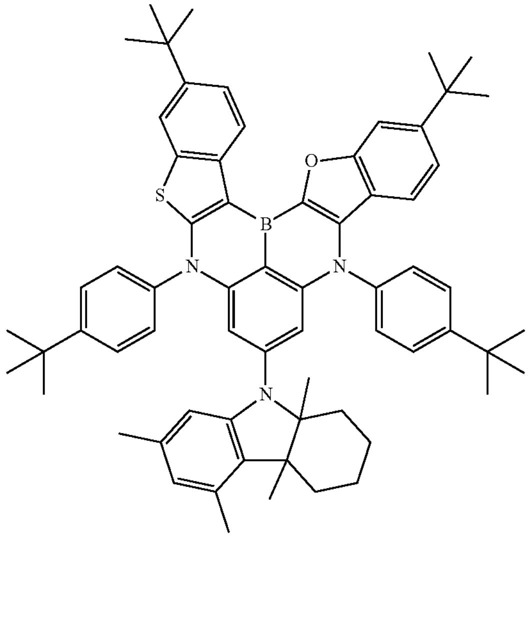
-continued
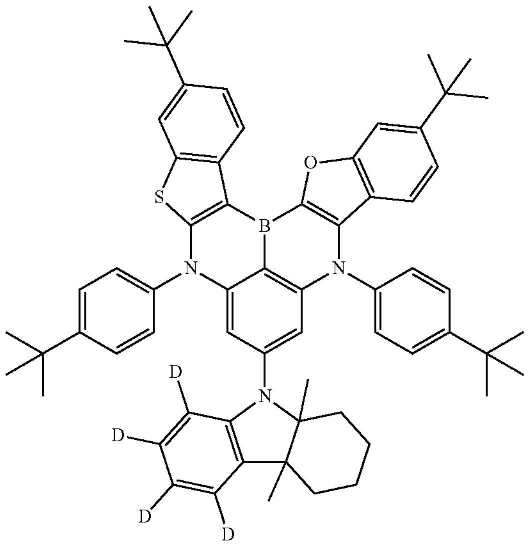
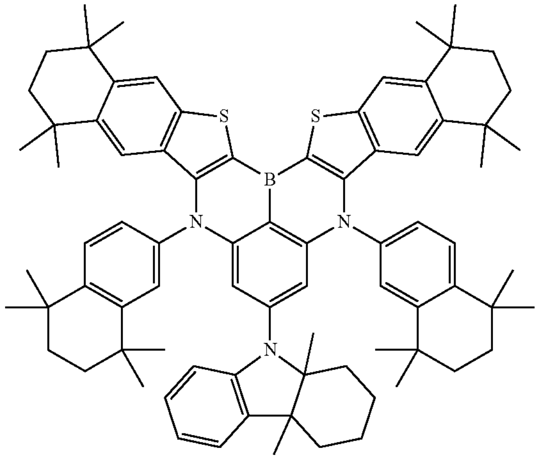
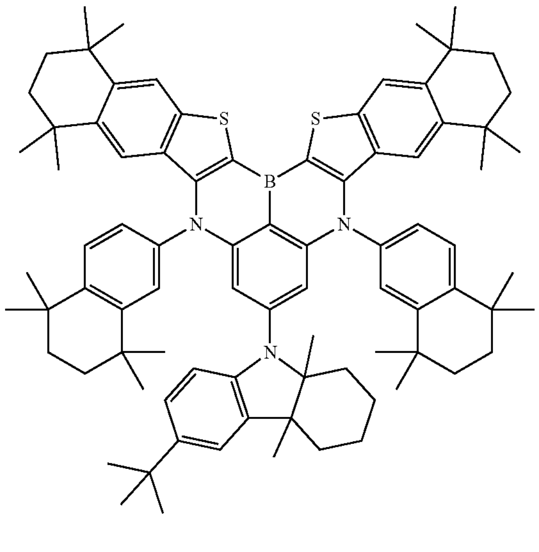

-continued
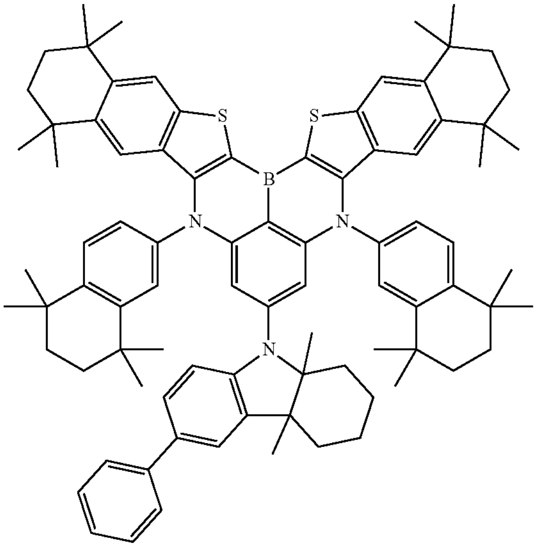
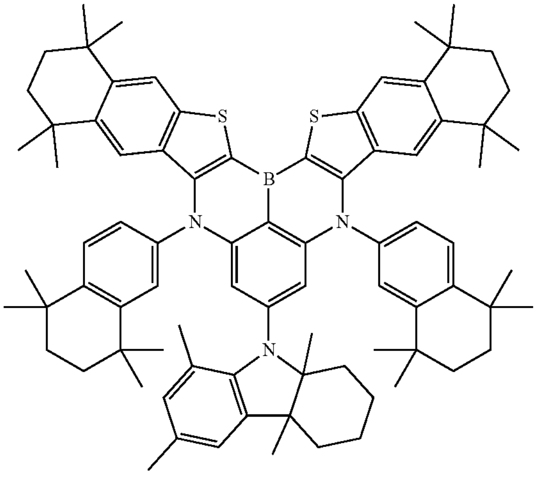
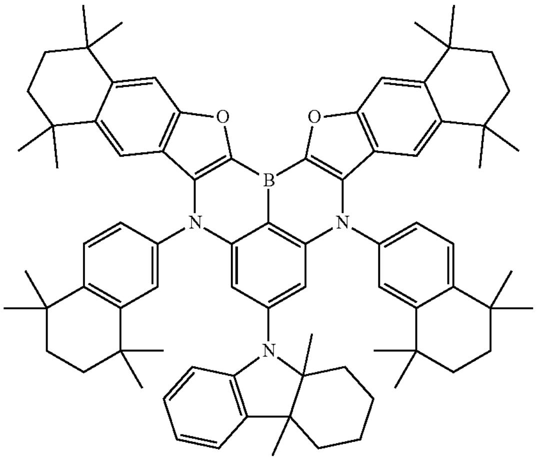
-continued
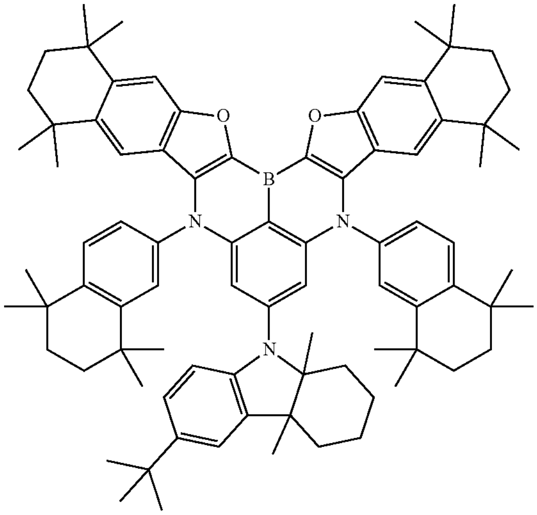
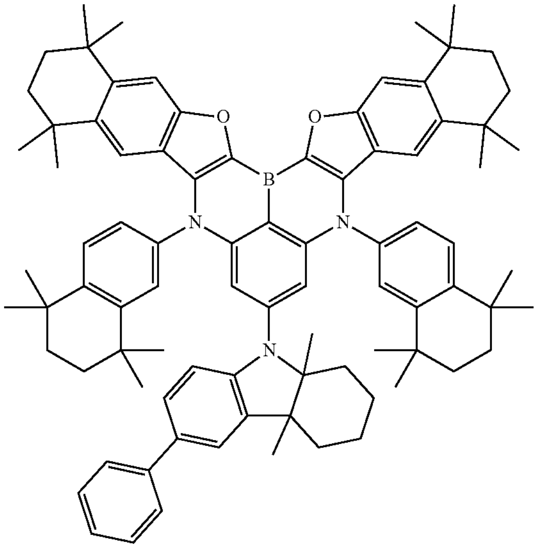
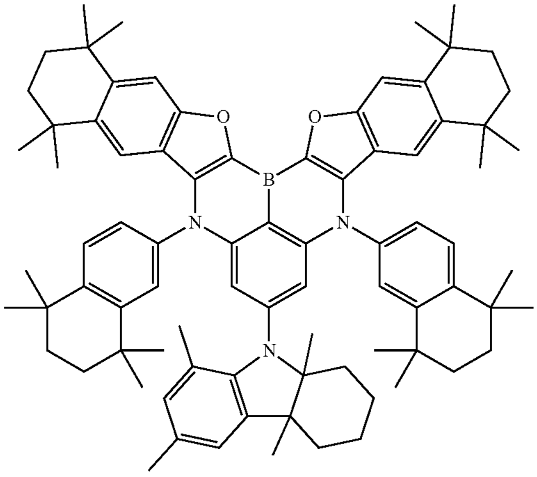

-continued
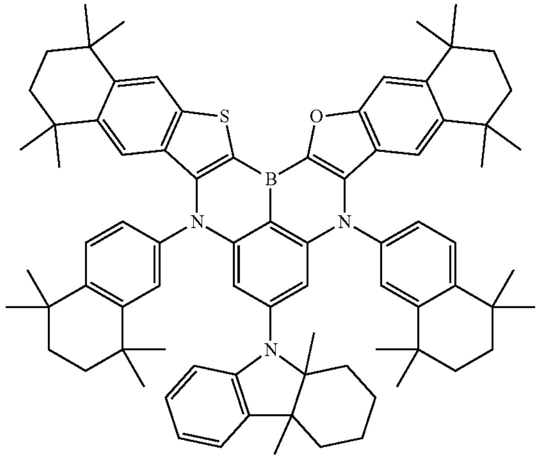
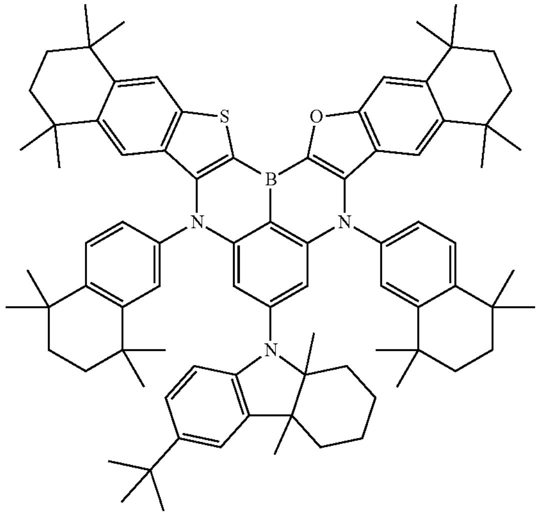
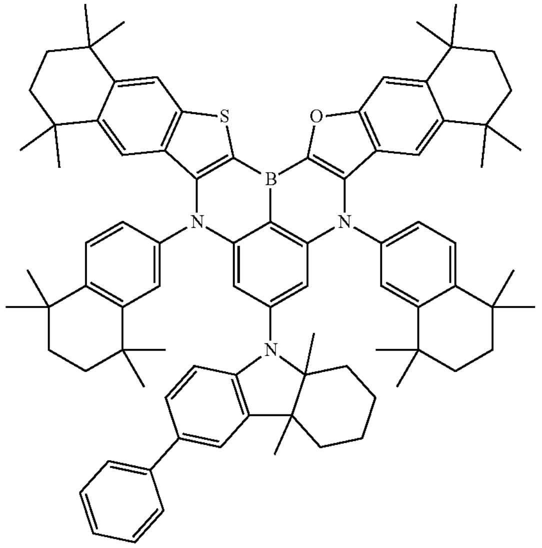
-continued
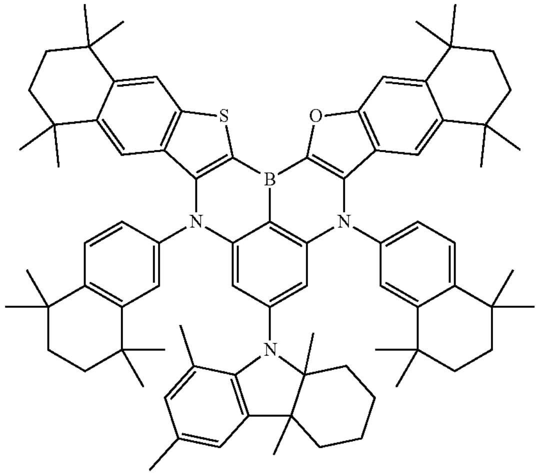
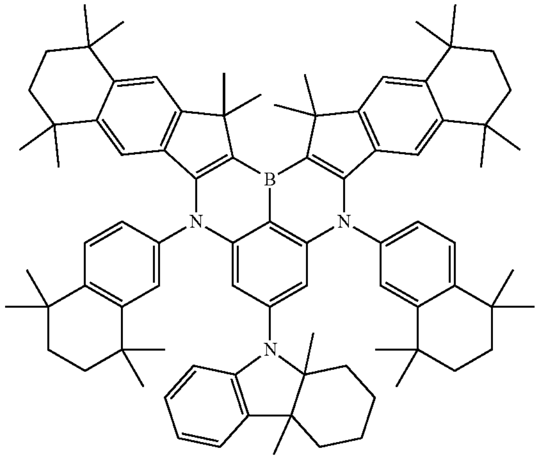
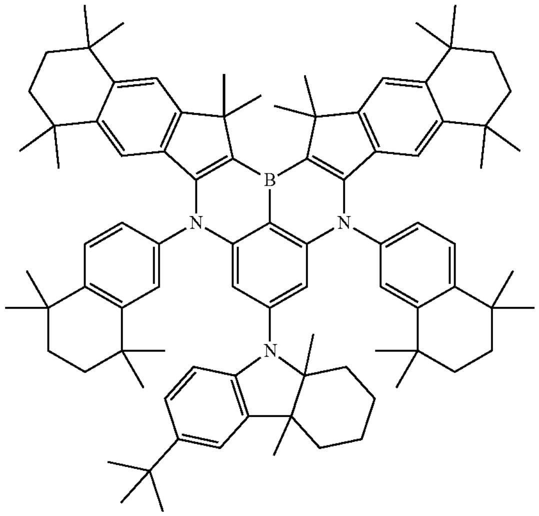

-continued
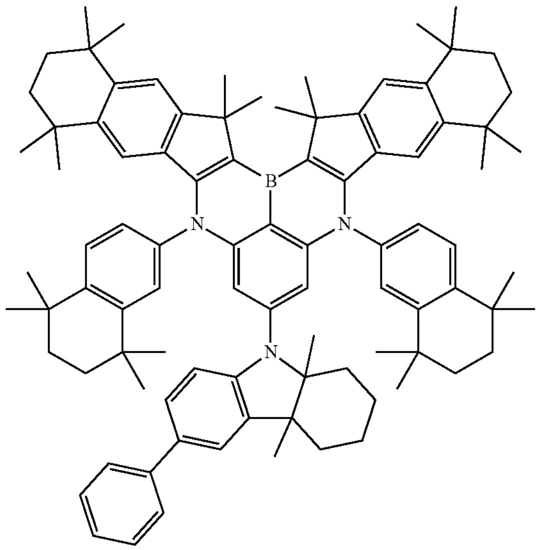
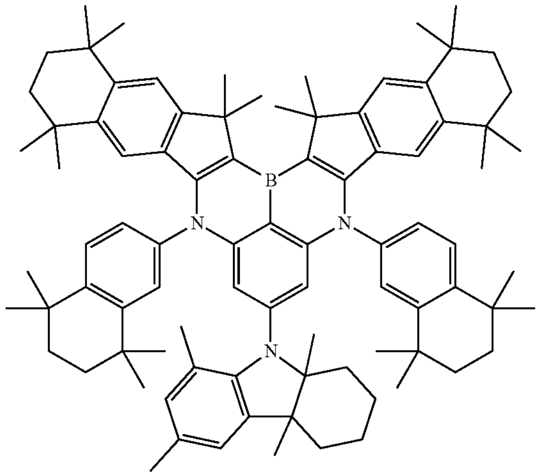
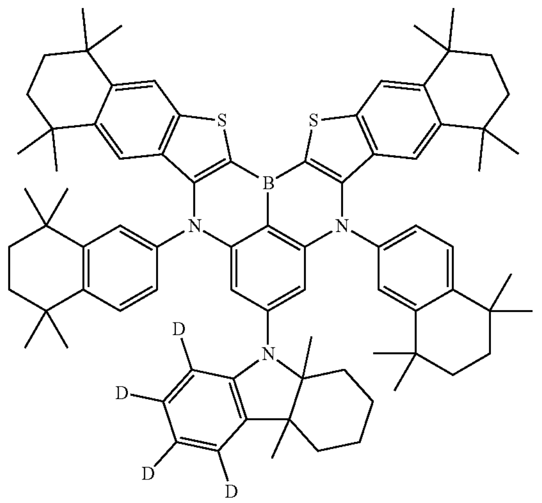
-continued
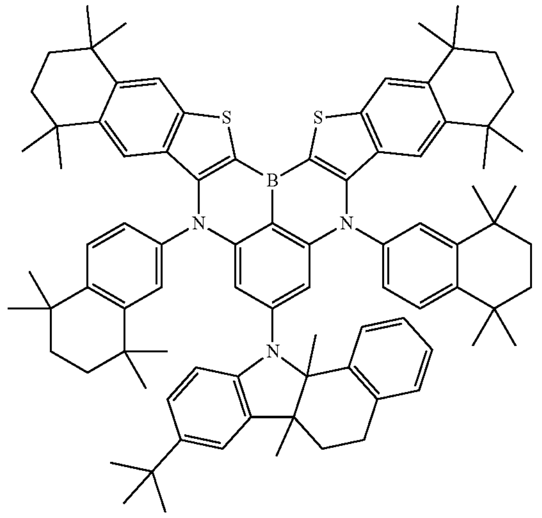
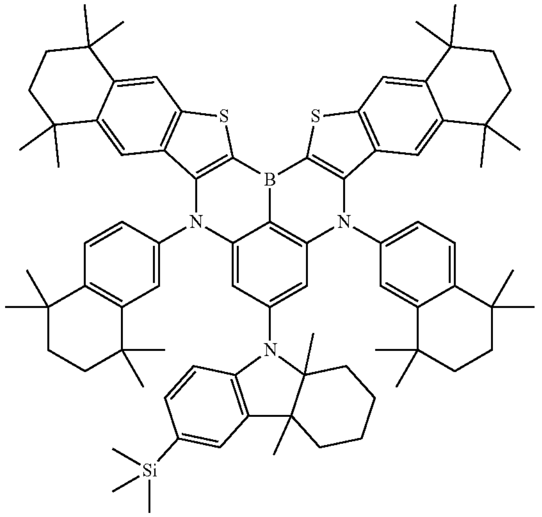
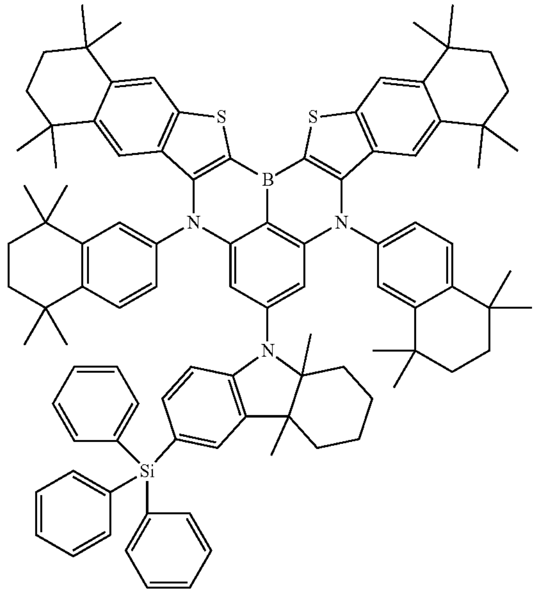

-continued
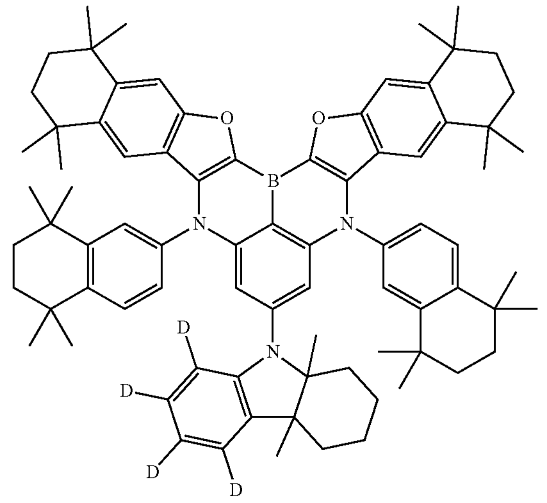
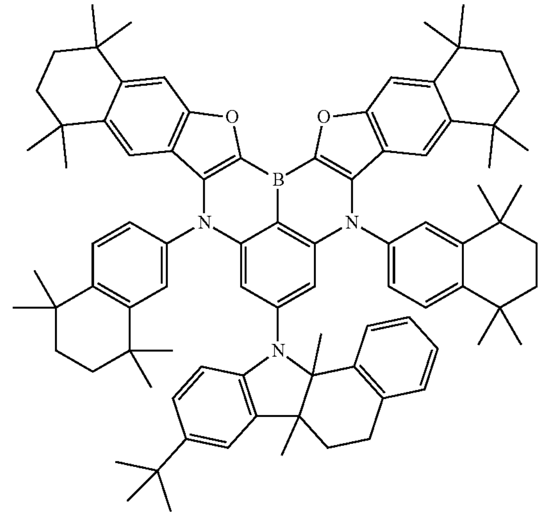
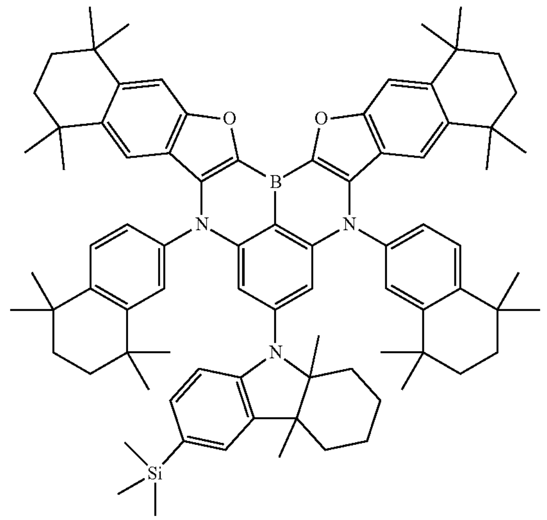
-continued
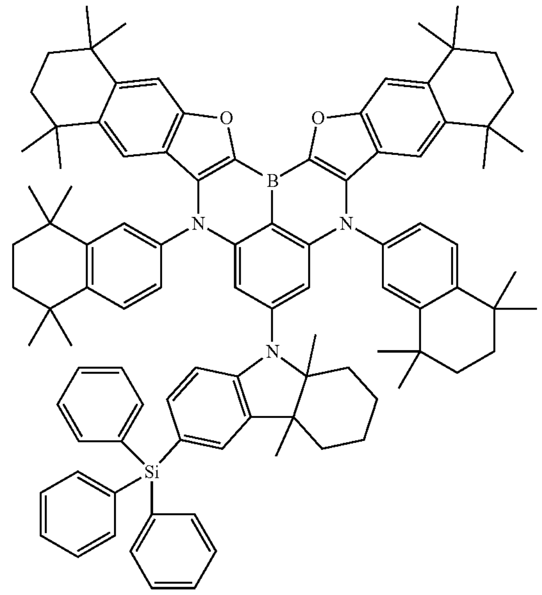
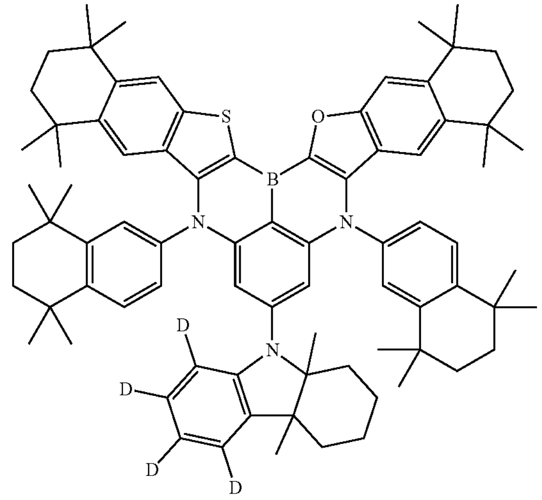
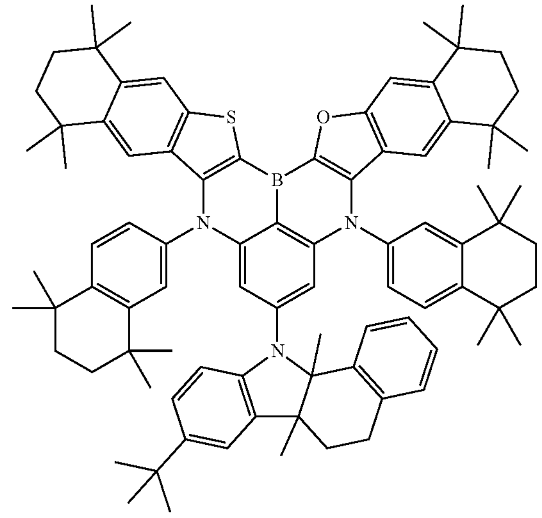

-continued
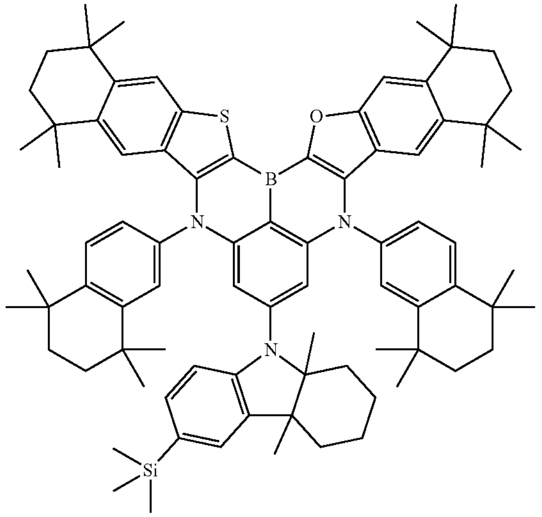
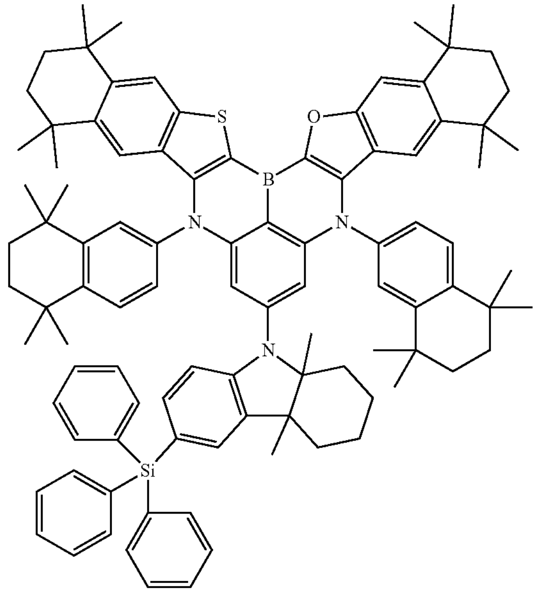
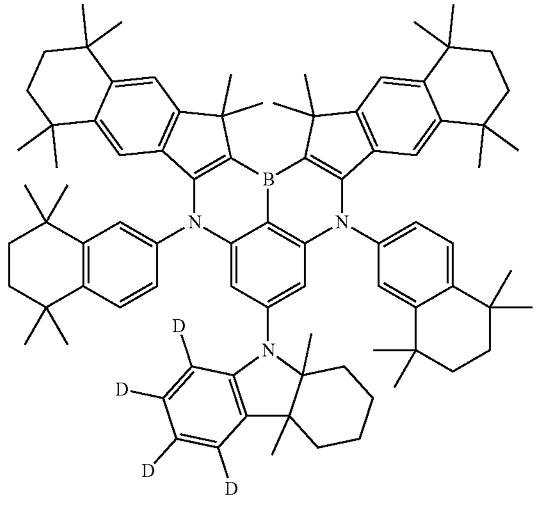
-continued
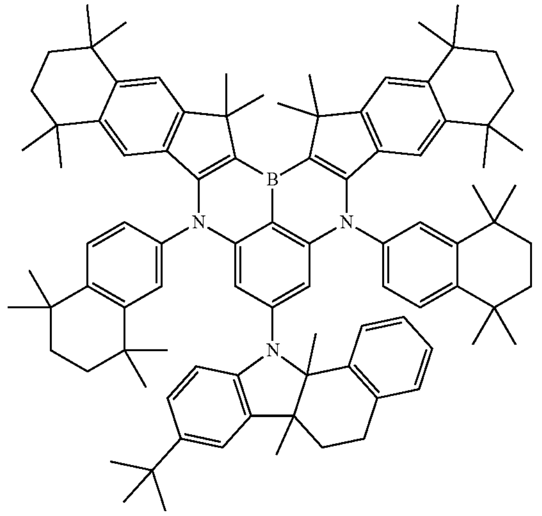
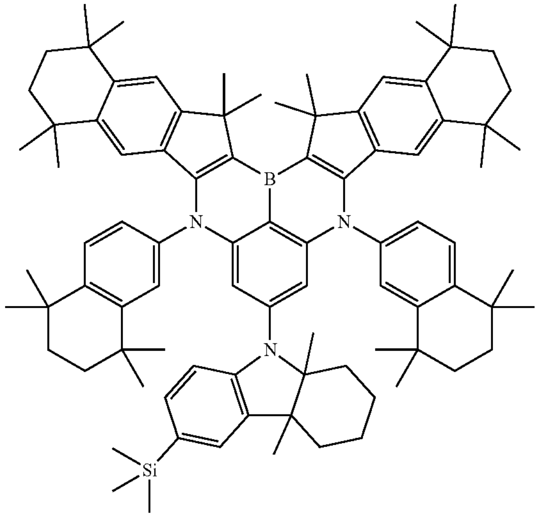
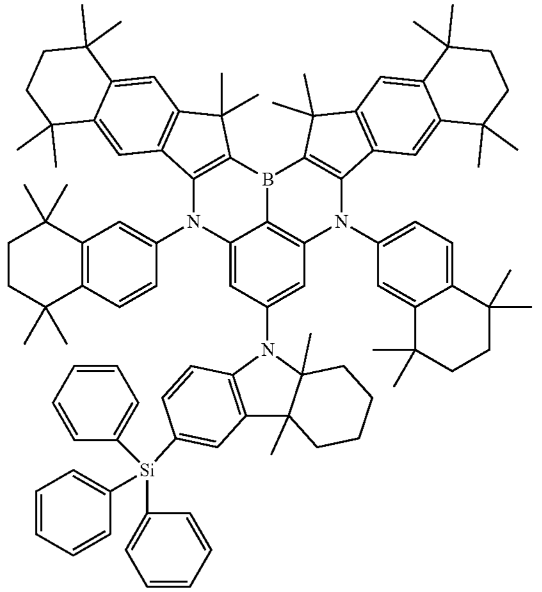

-continued
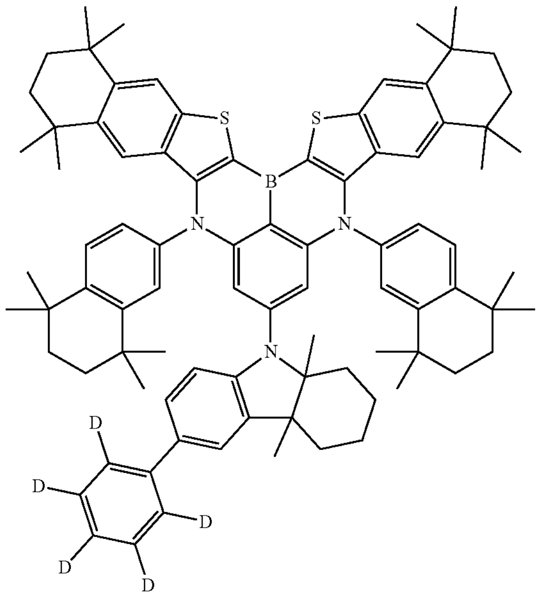
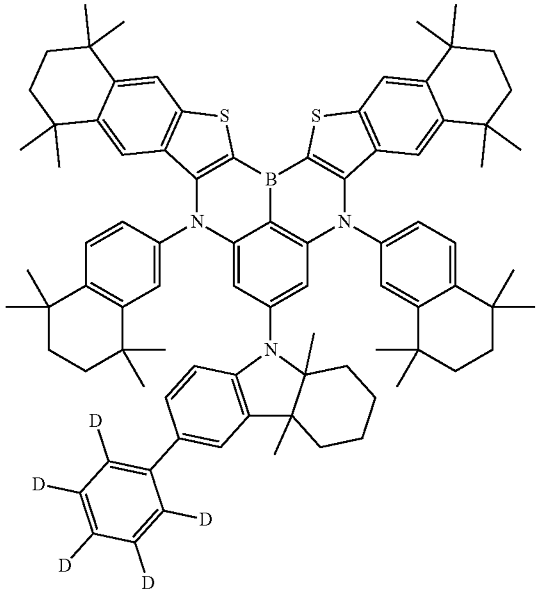
-continued
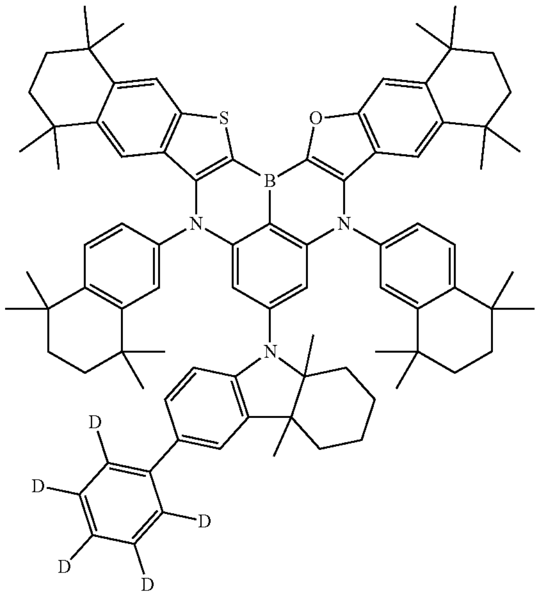
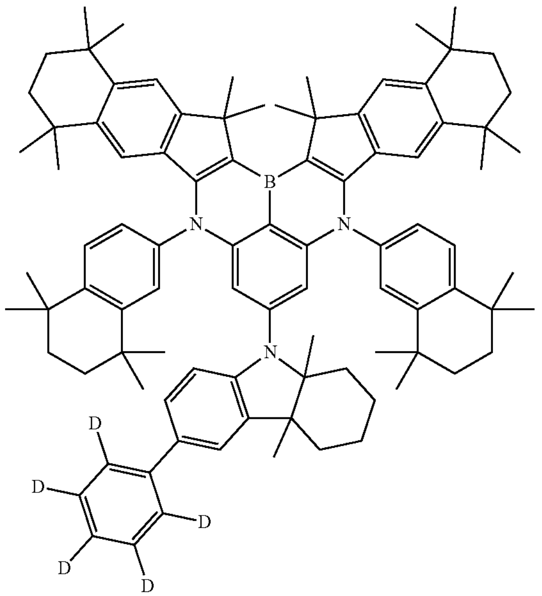
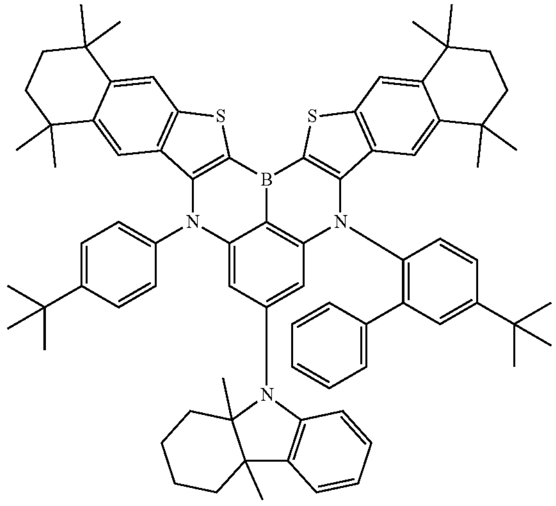

-continued
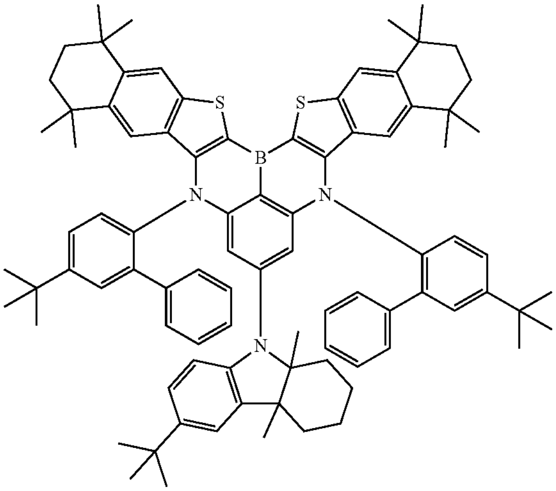
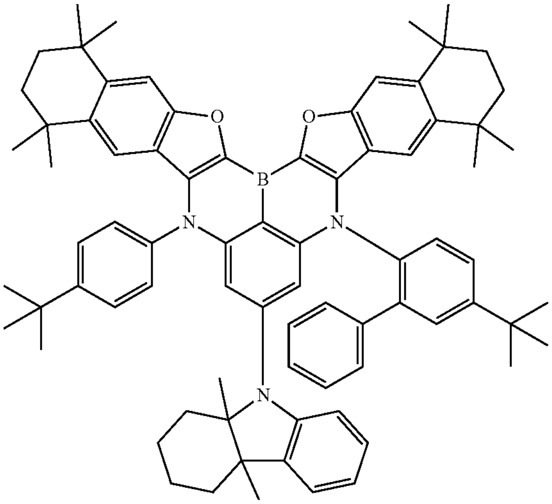
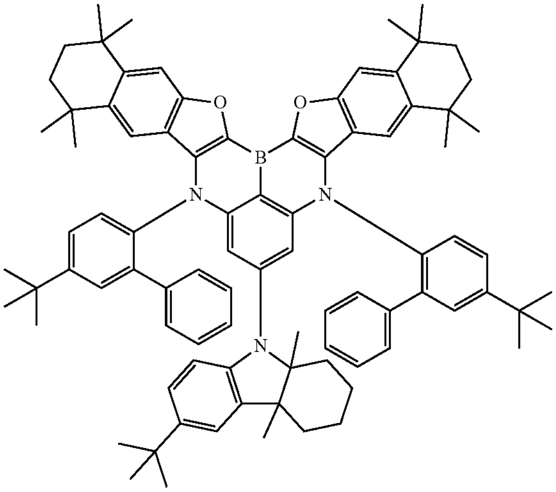
-continued
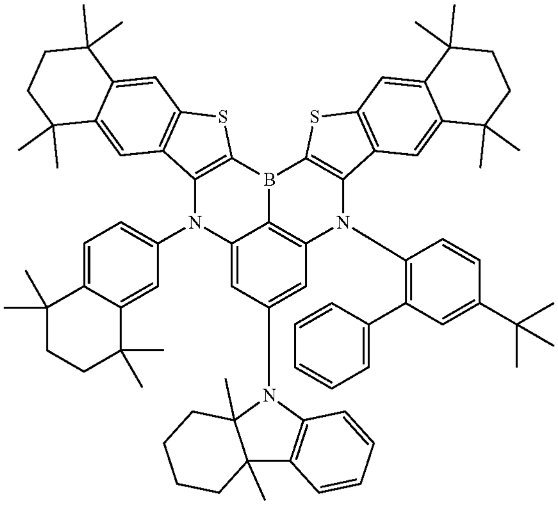
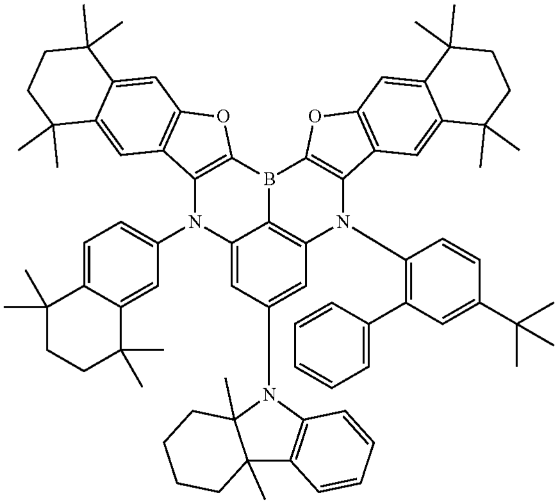
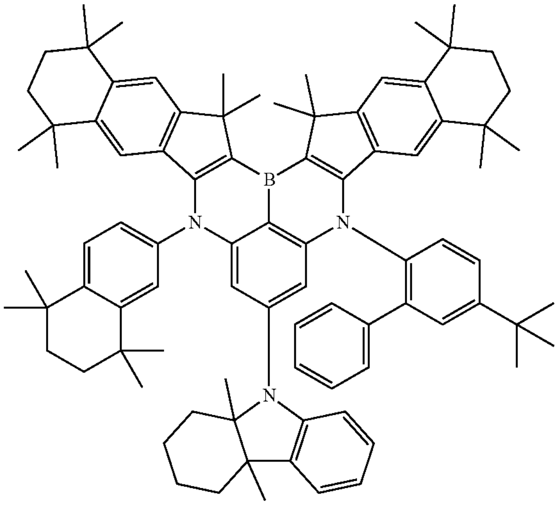

-continued
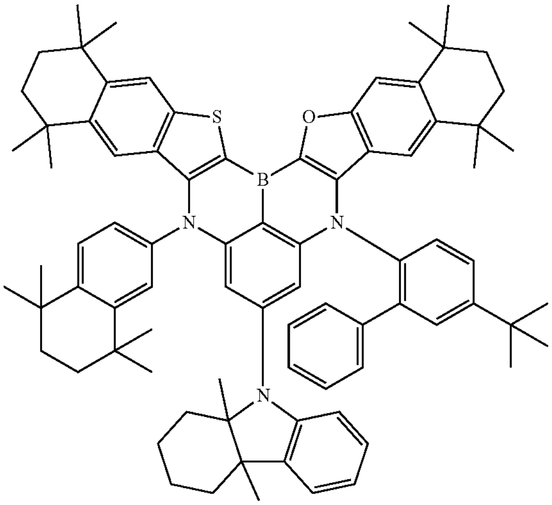
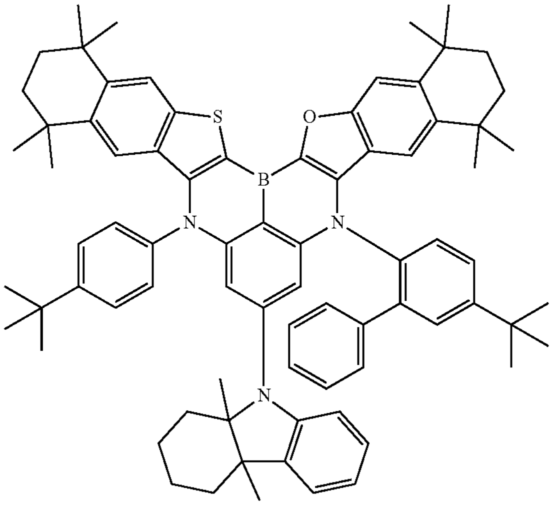
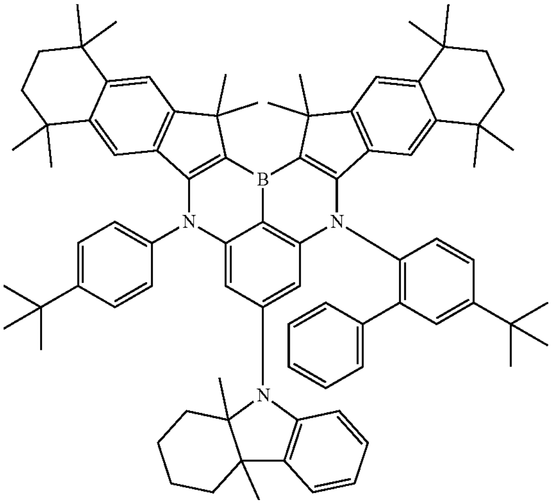
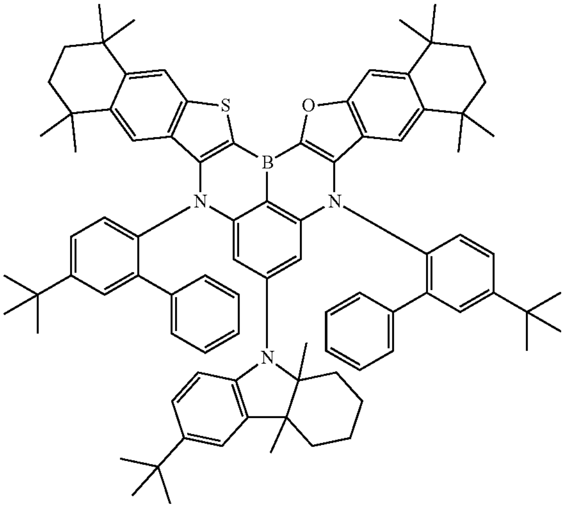
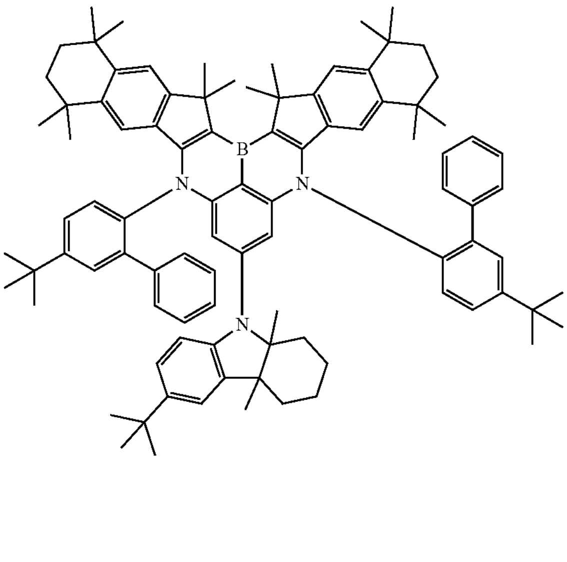
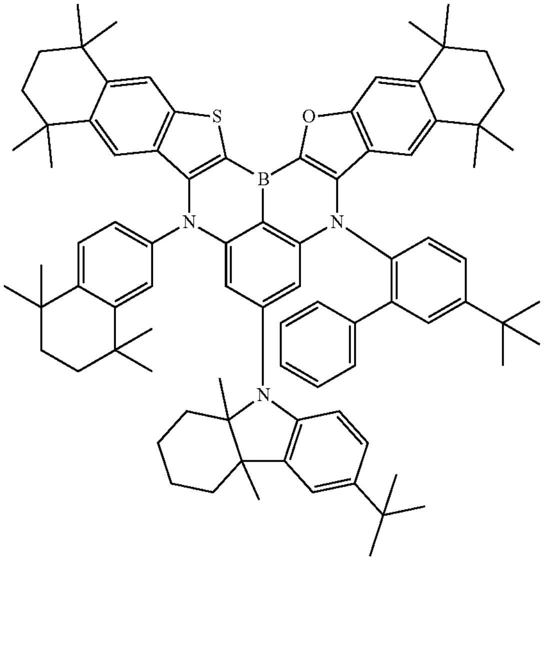
-continued -continued
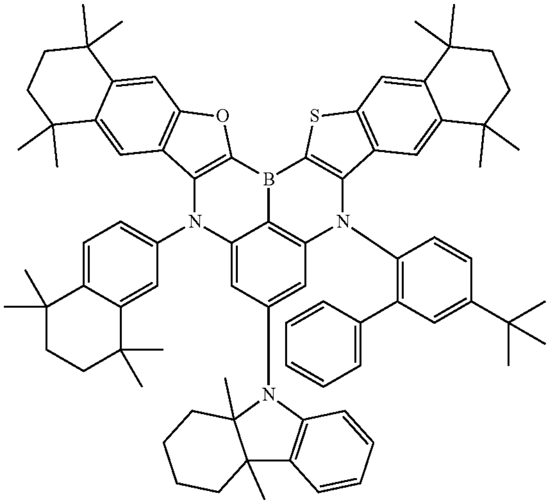
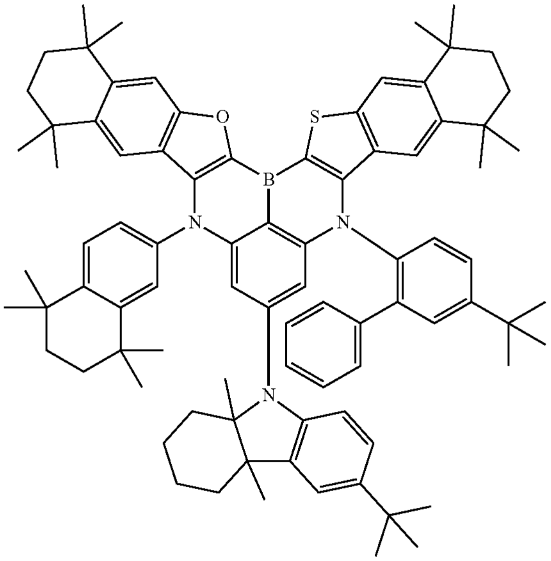
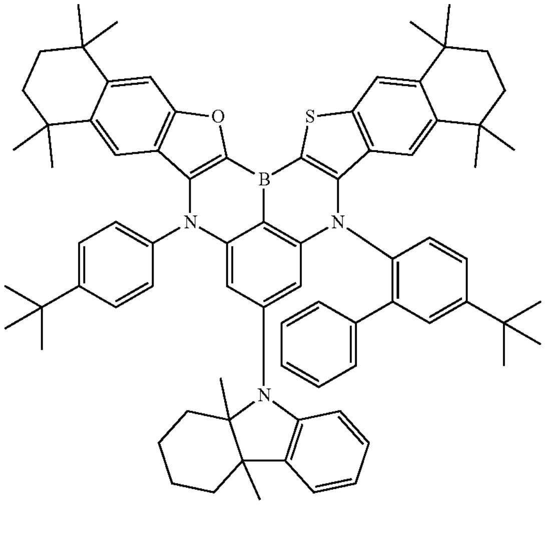
-continued
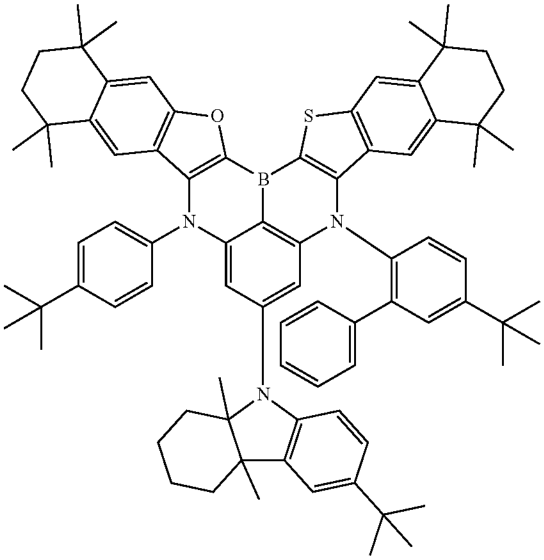 [SMILES: CC(C)(C)c1ccc(N2c3cc(N4c5ccc(C(C)(C)C)cc5C5(C)CCCCC45C)cc4c3B(c3oc5cc6c(cc5c32)C(C)(C)CCC6(C)C)c2sc3cc5c(cc3c2N4c2ccc(C(C)(C)C)cc2-c2ccccc2)C(C)(C)CCC5(C)C)cc1]
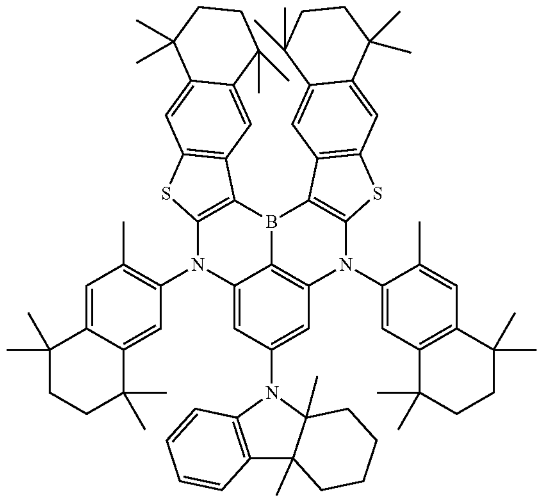
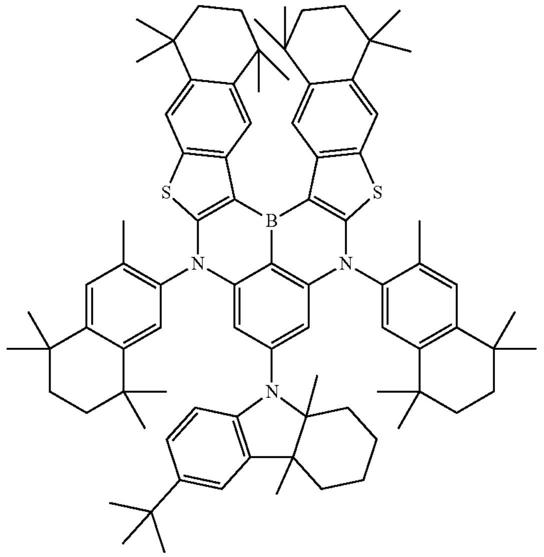

-continued
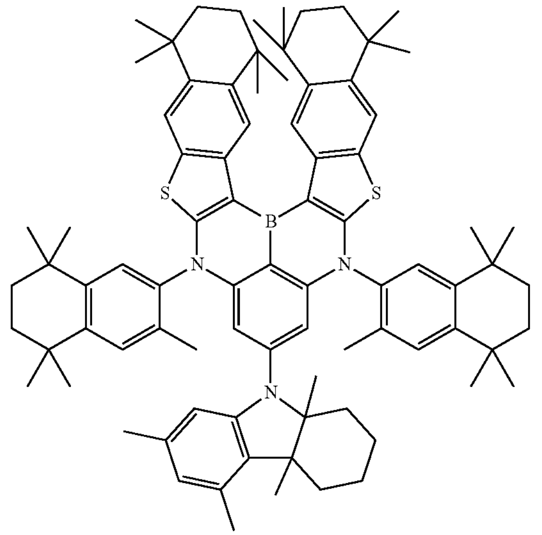
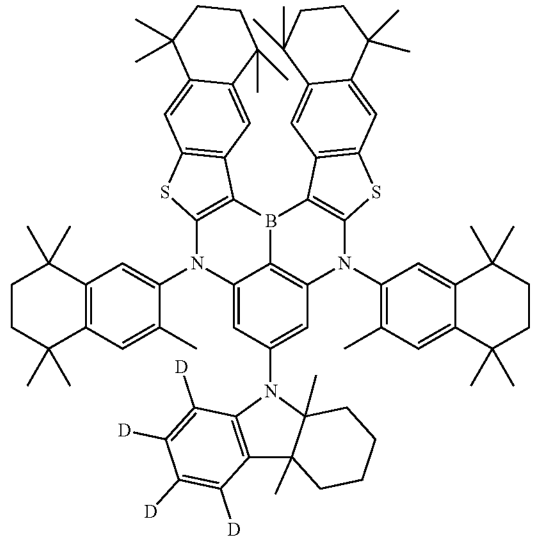
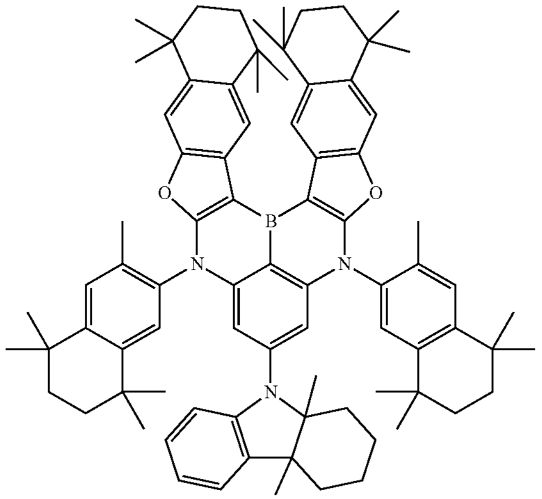
-continued
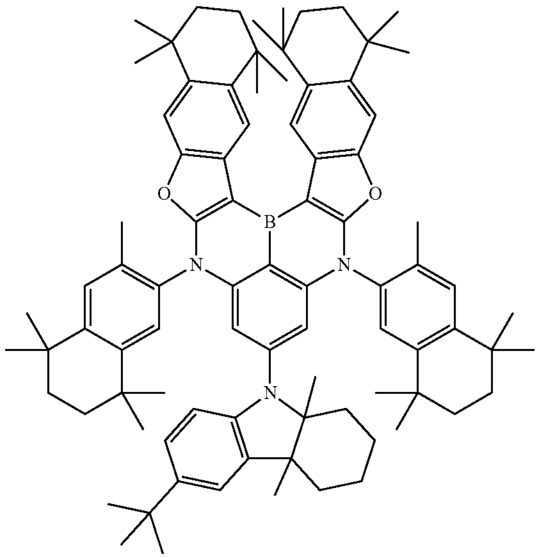
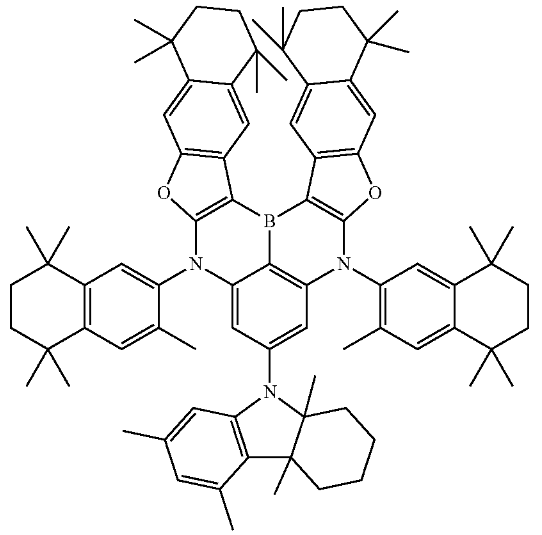
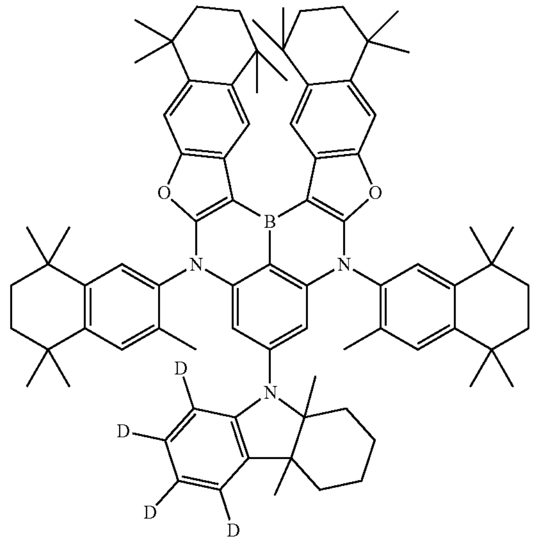

-continued
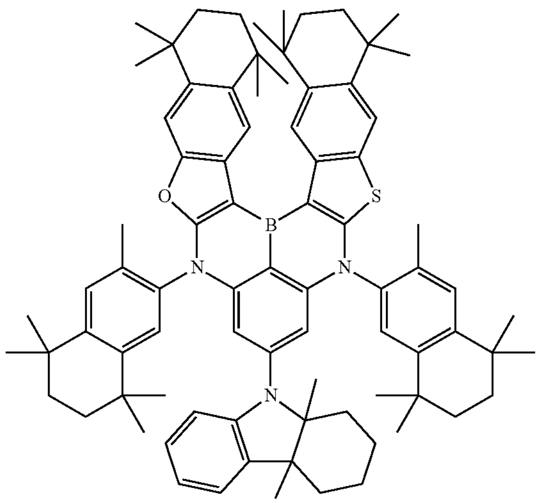
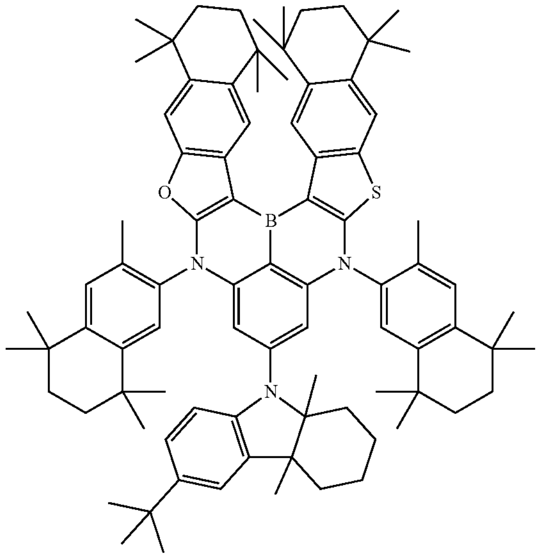
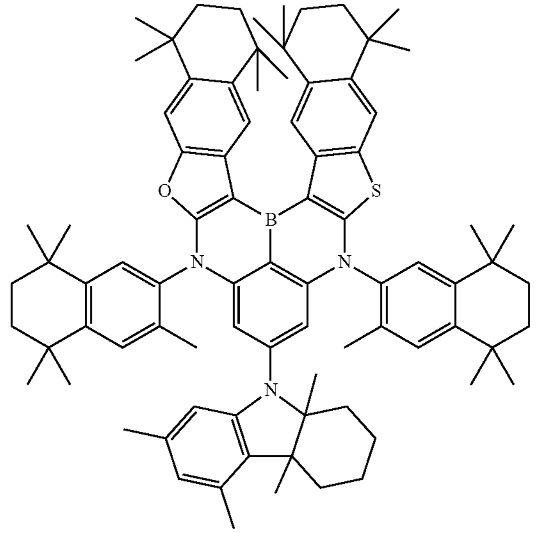
-continued
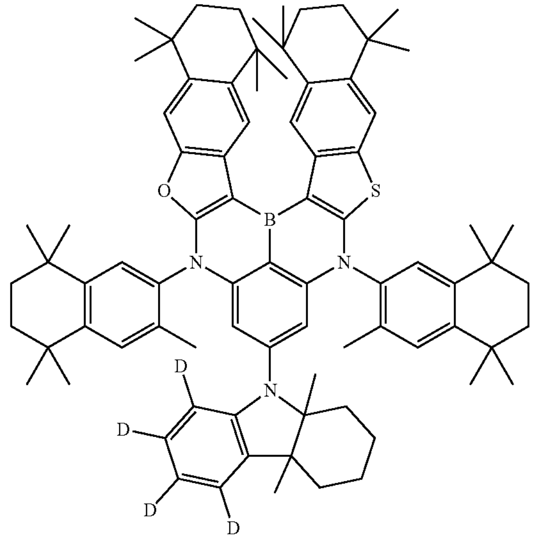
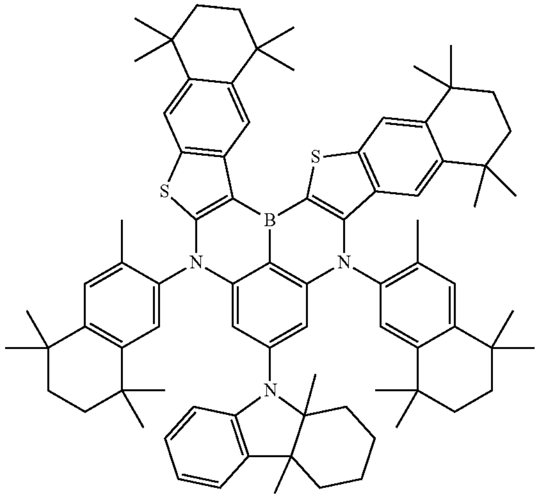
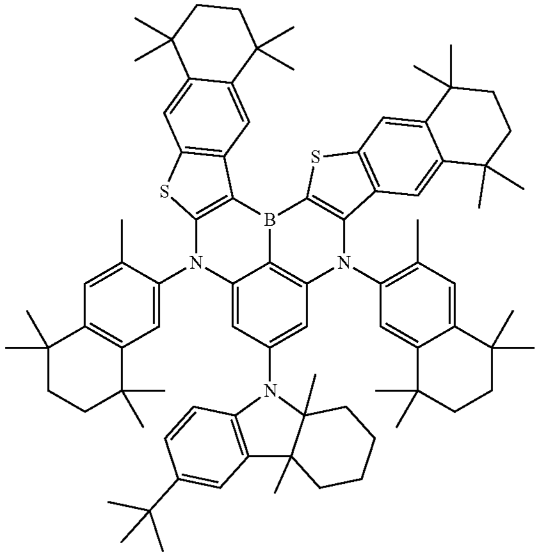

-continued
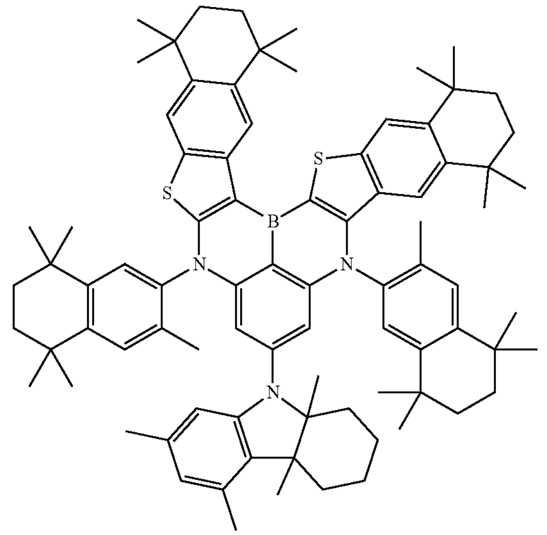
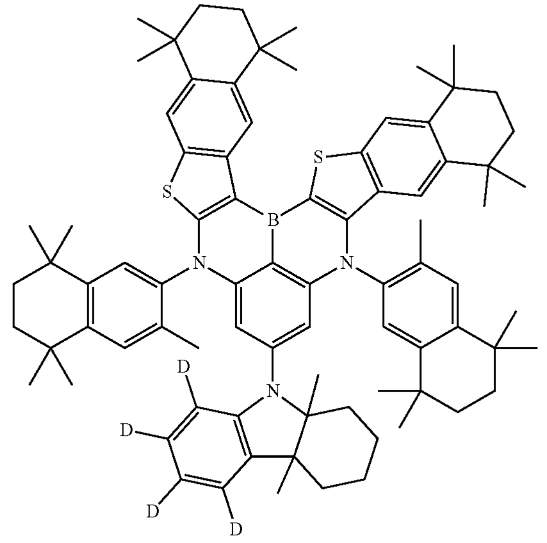
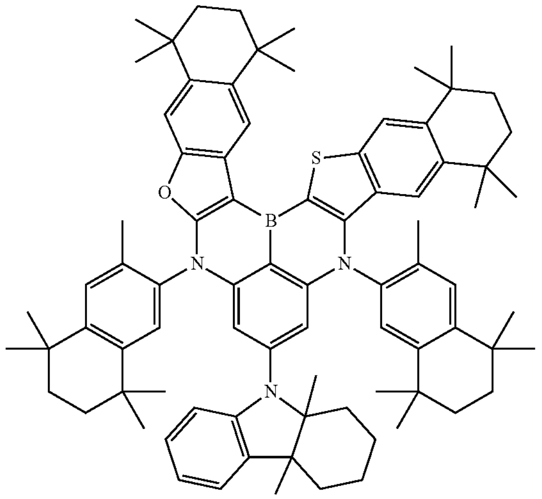
-continued
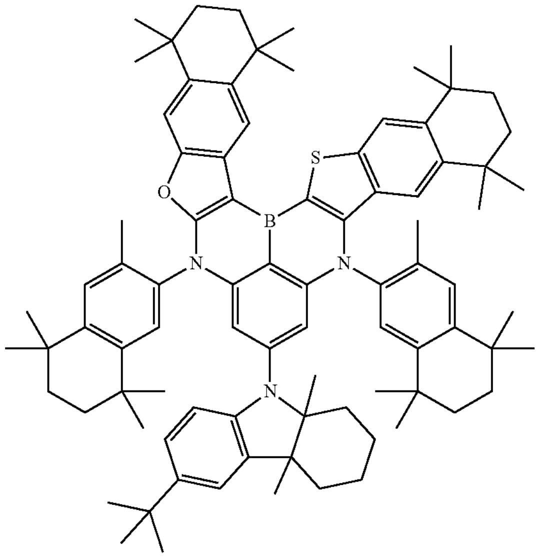
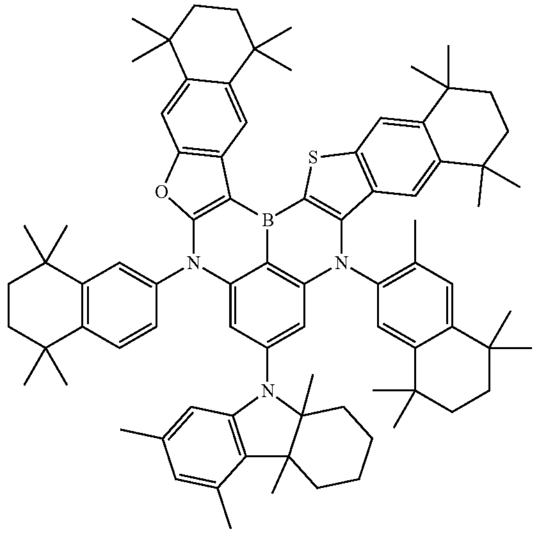
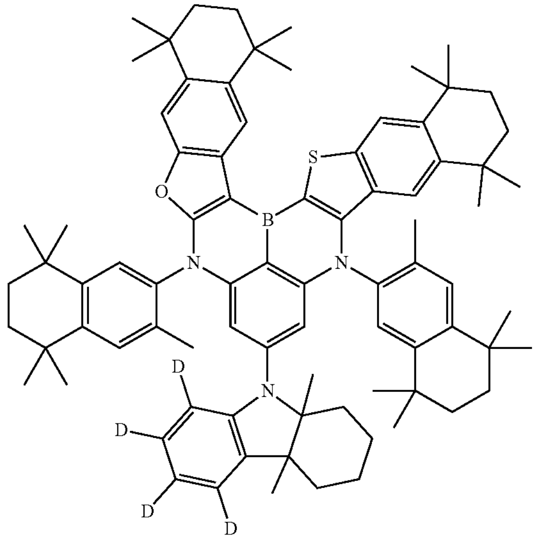

-continued
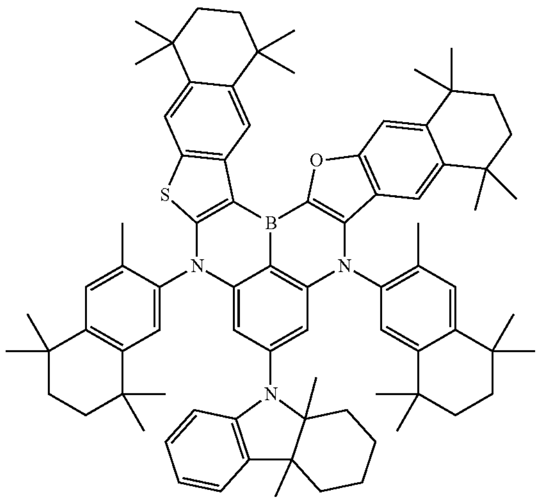
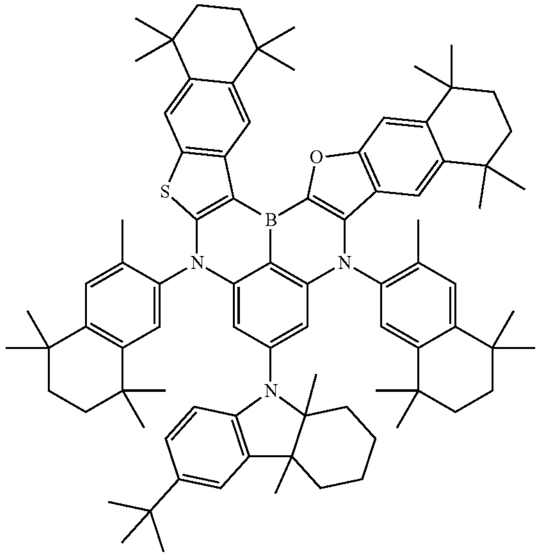
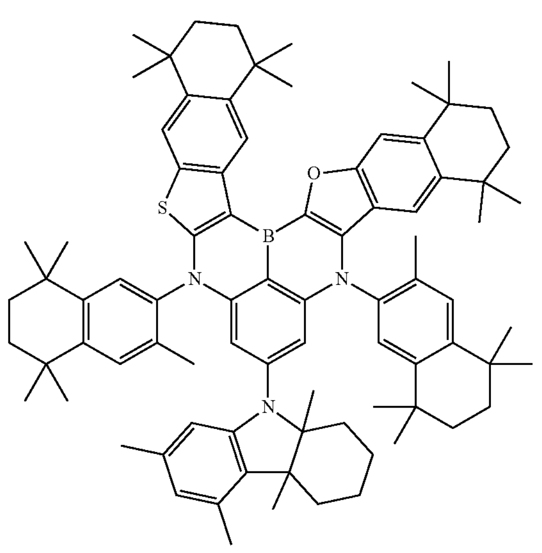
-continued
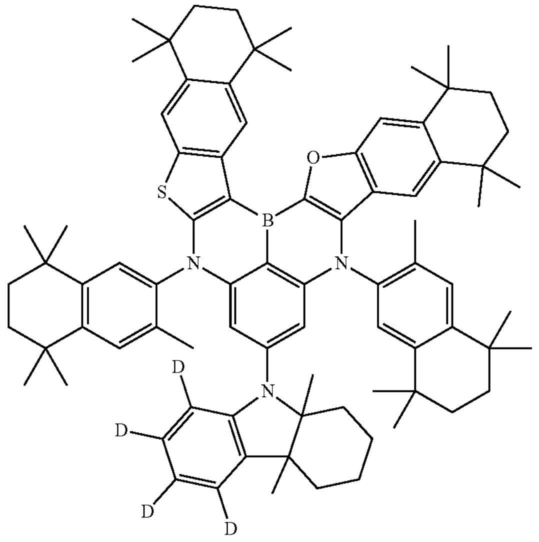
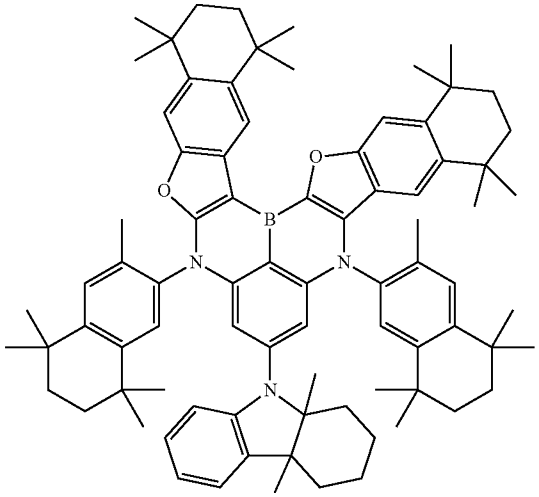
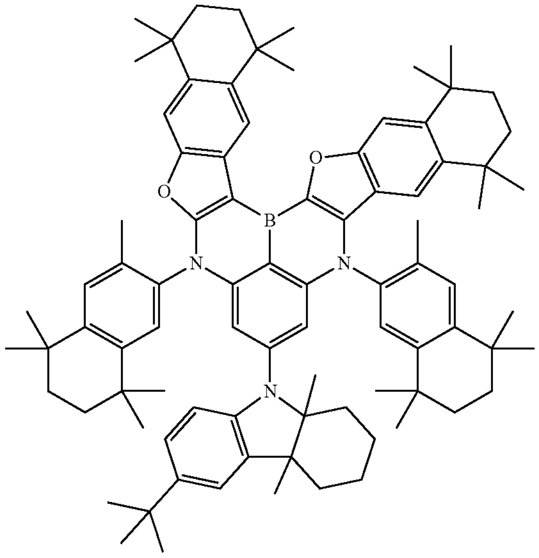

-continued
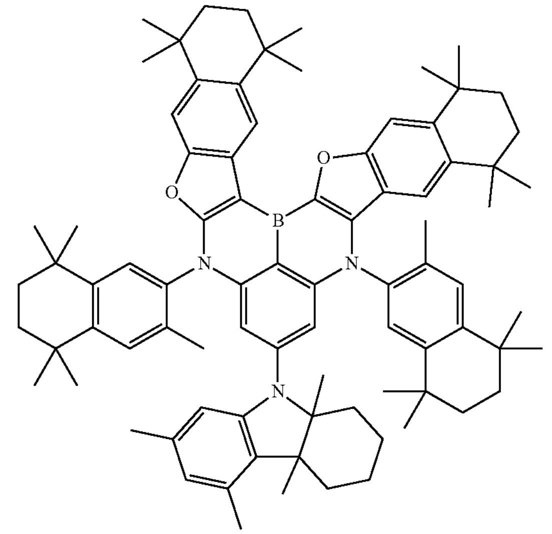
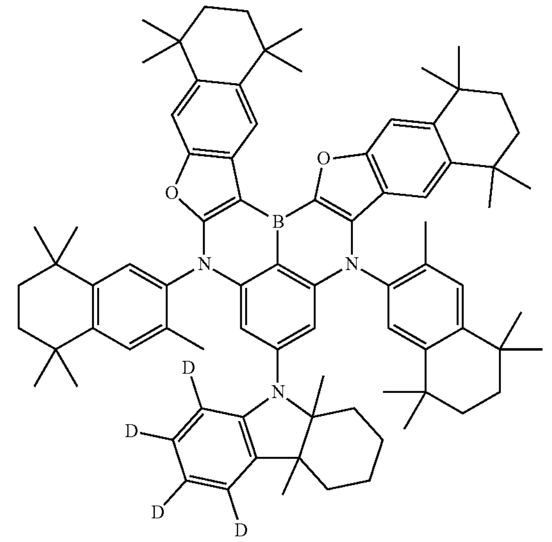
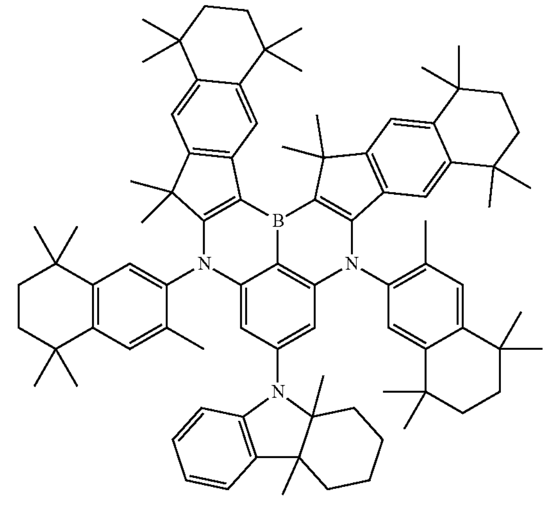
-continued
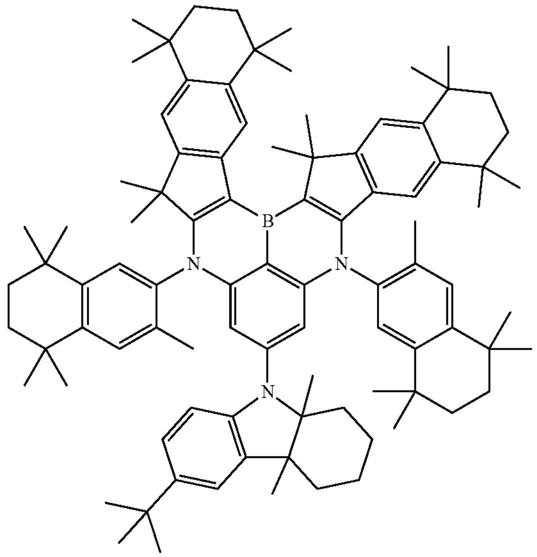
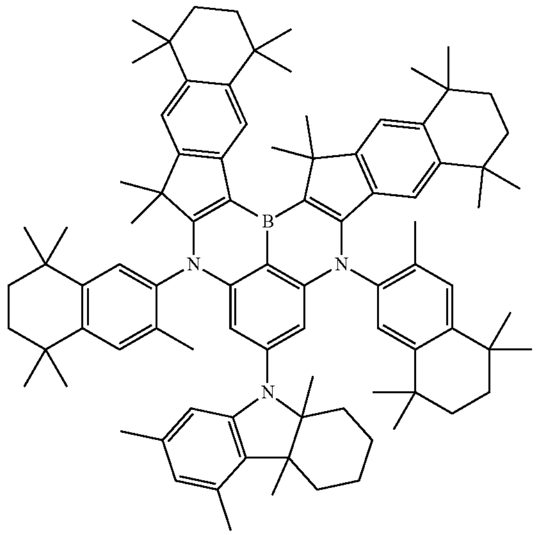
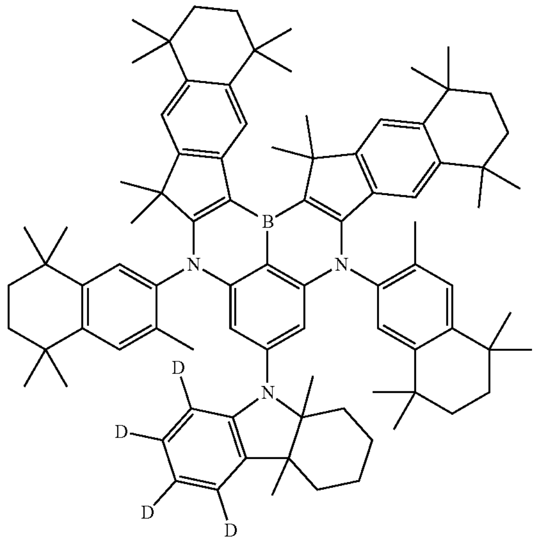

-continued
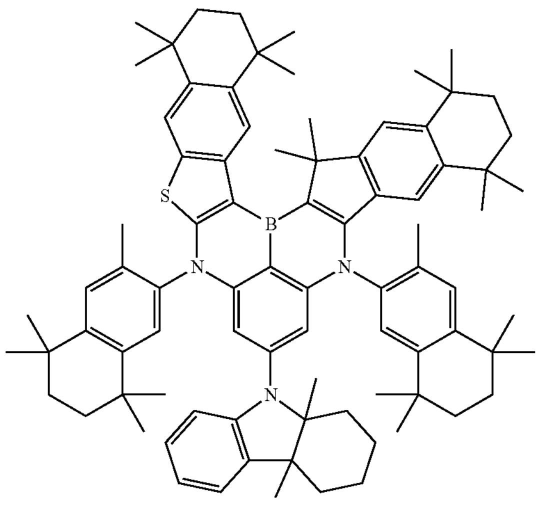
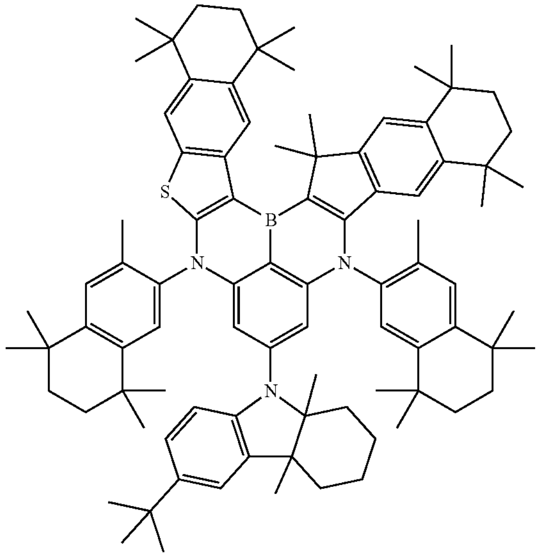
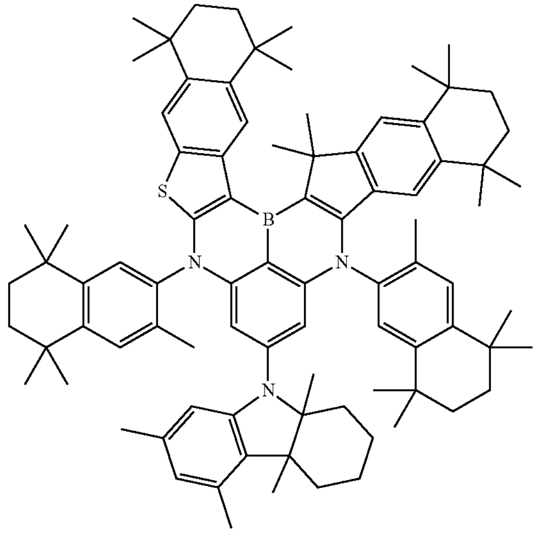
-continued
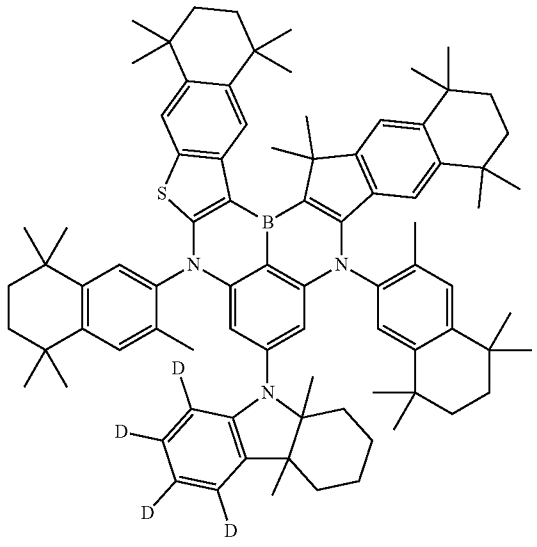
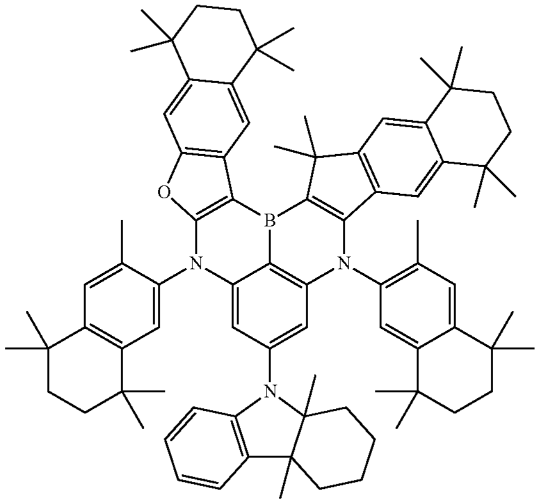
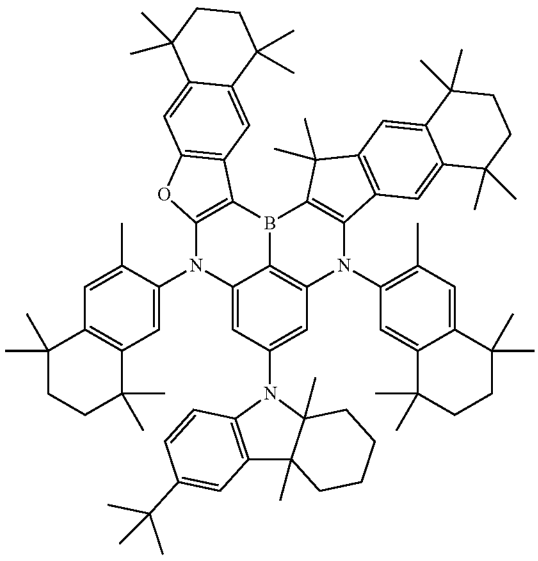

-continued
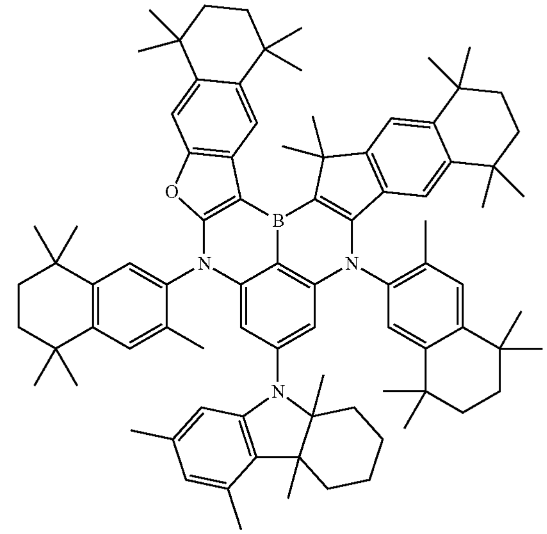
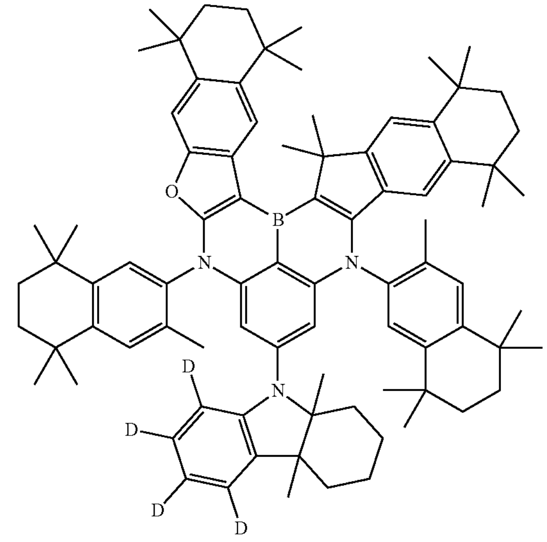
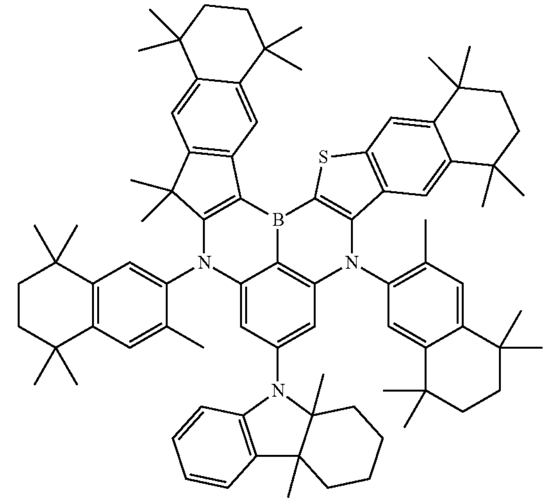
-continued
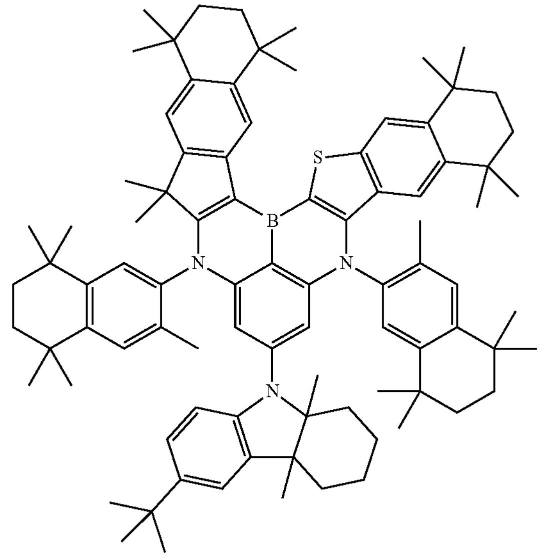
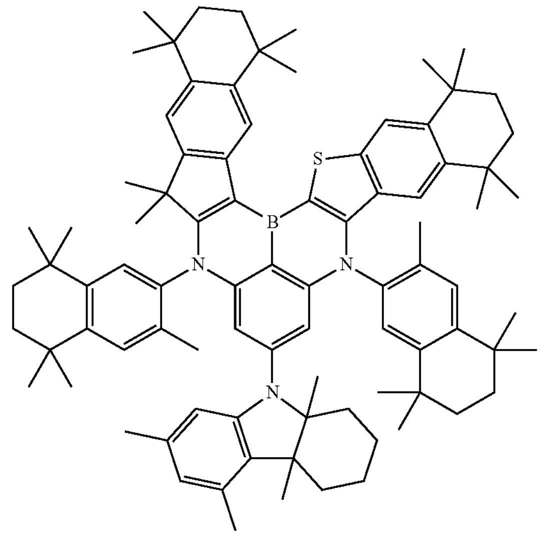
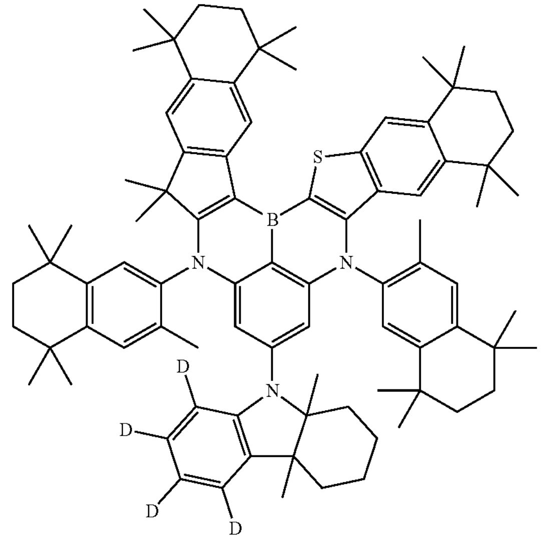

-continued
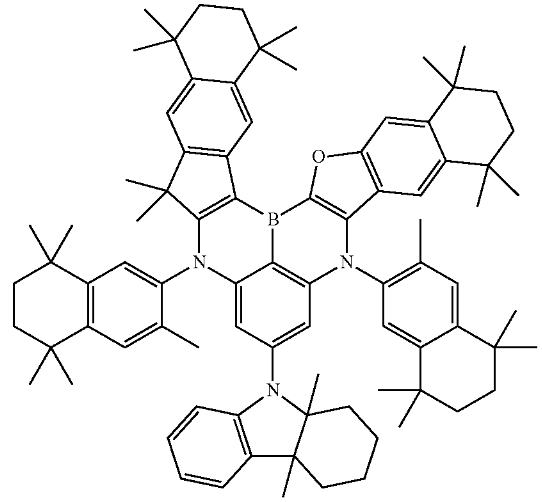
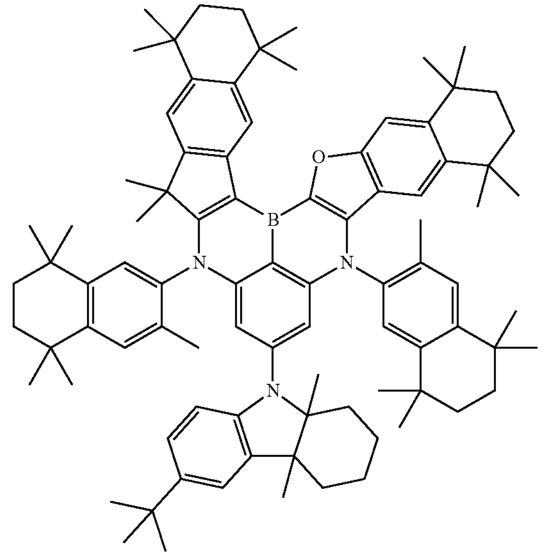
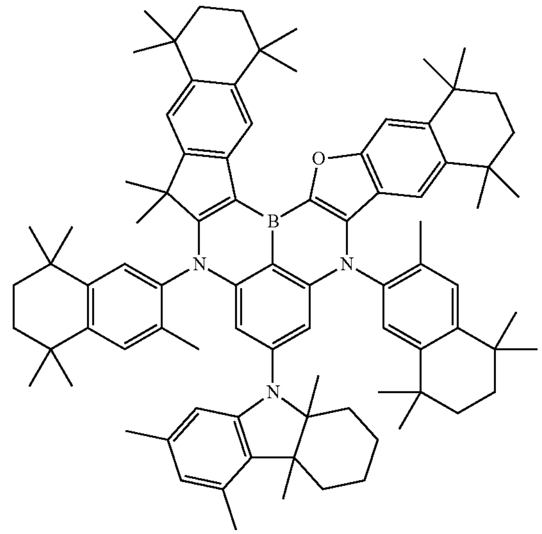
-continued
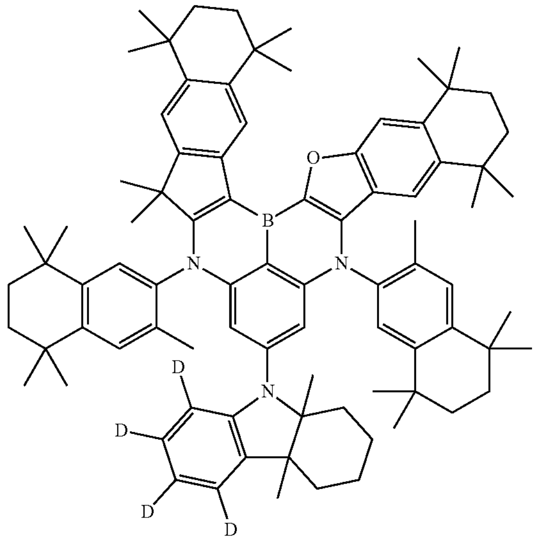
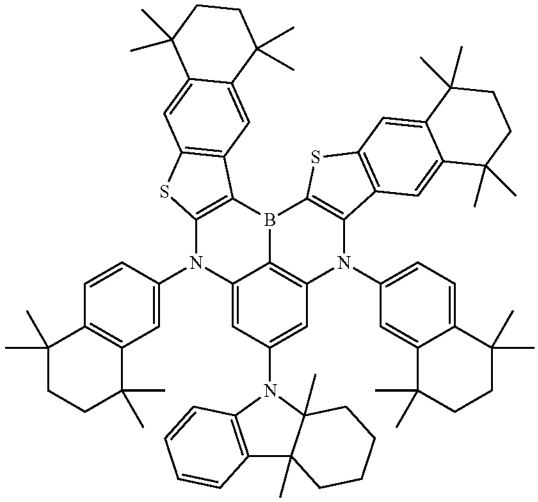
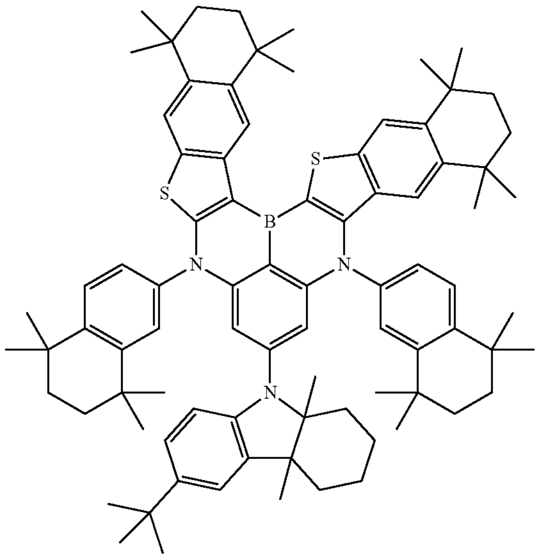

-continued
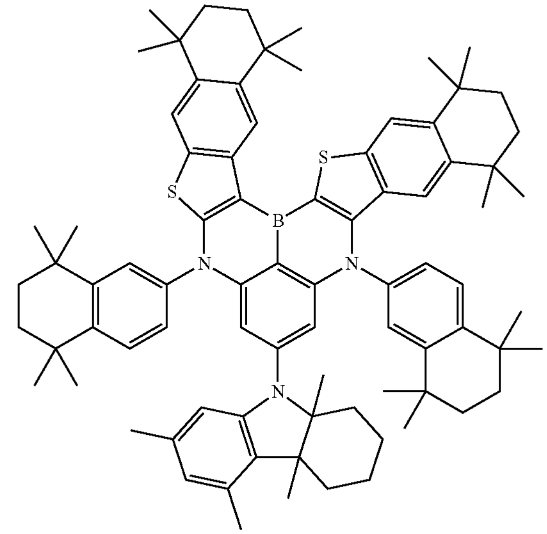
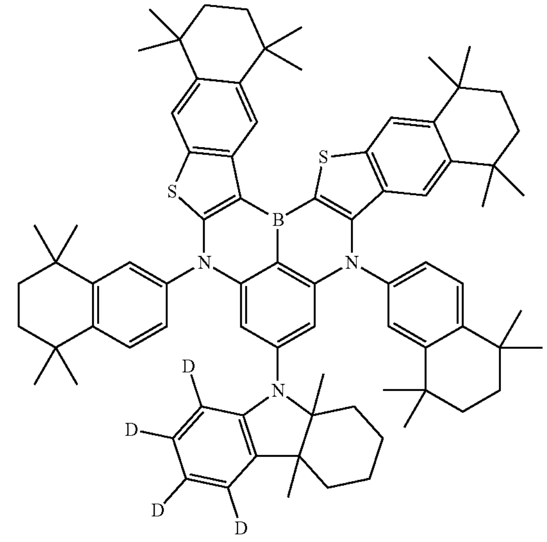
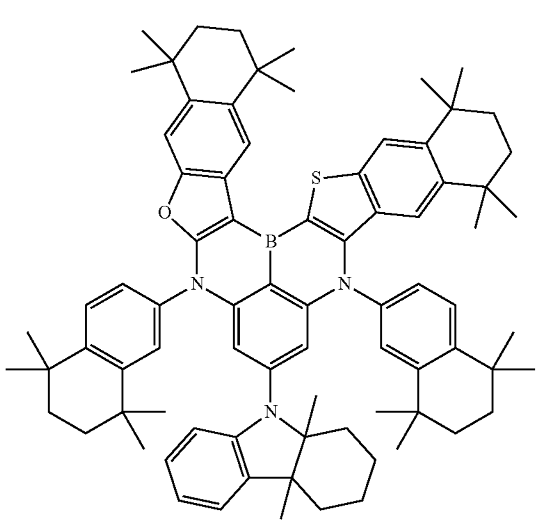
-continued
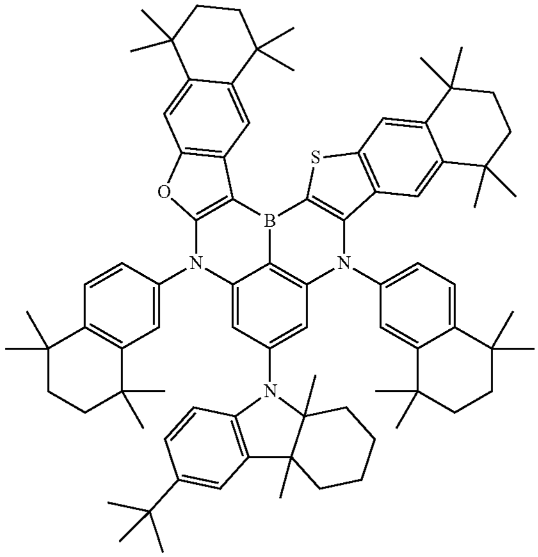
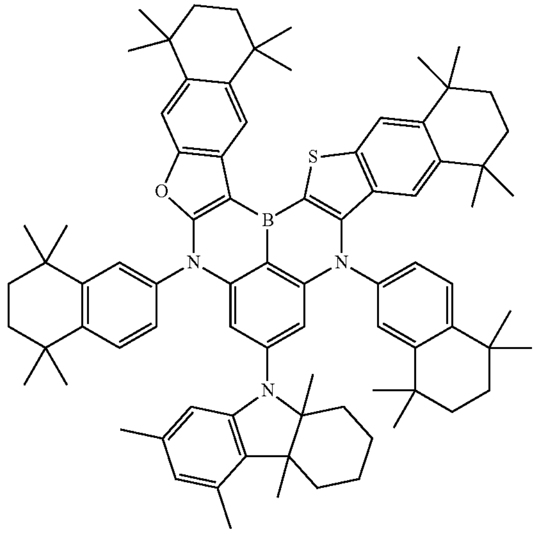
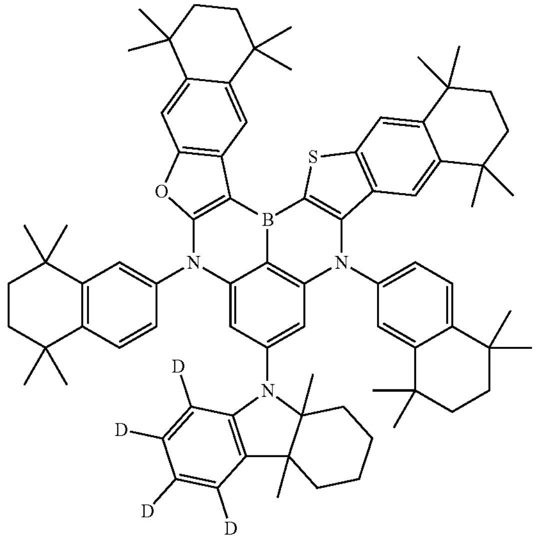

-continued
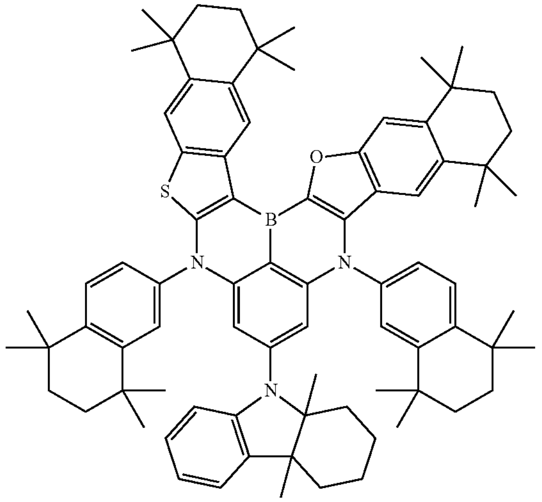
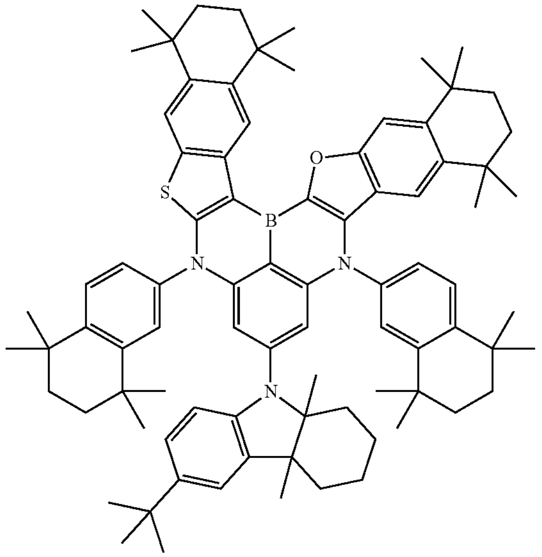
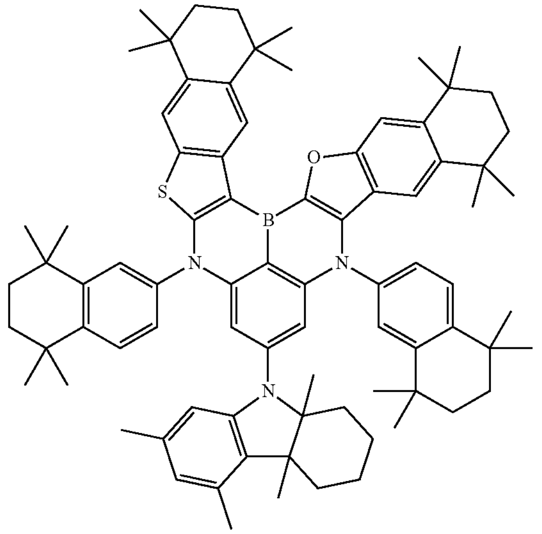
-continued
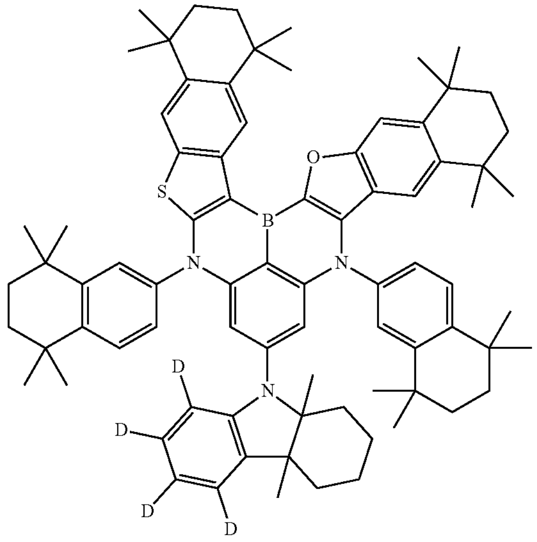
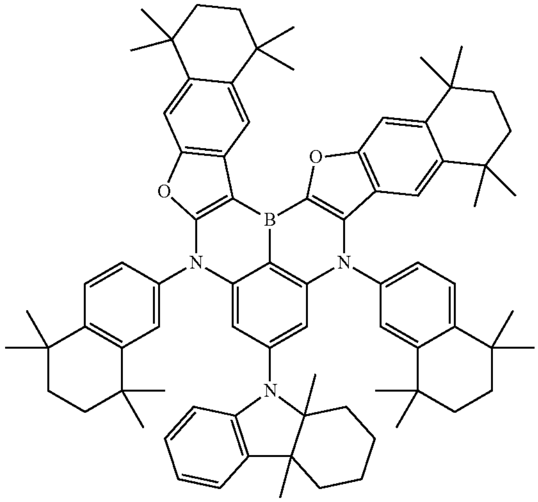
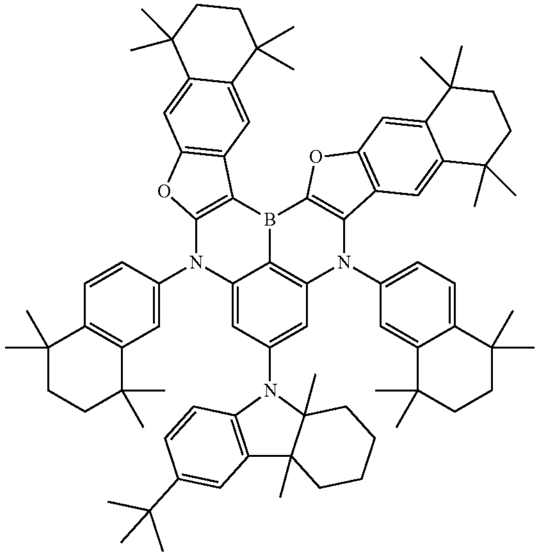

-continued
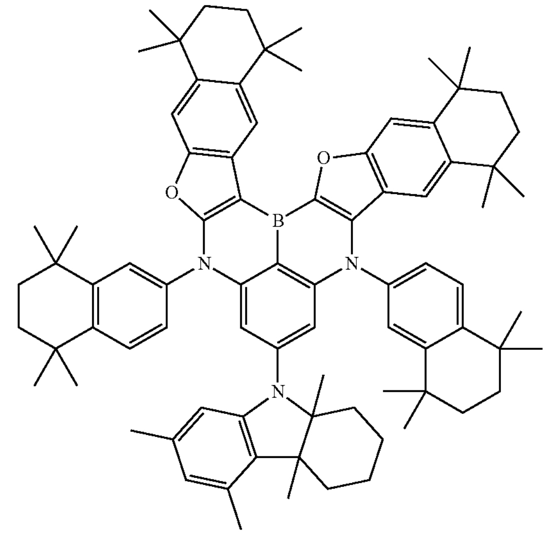
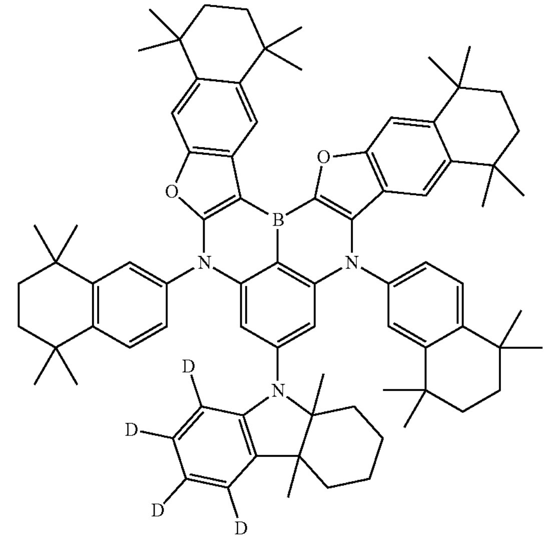
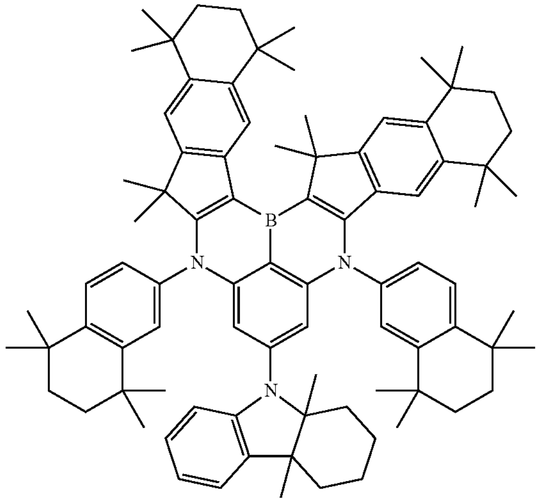
-continued
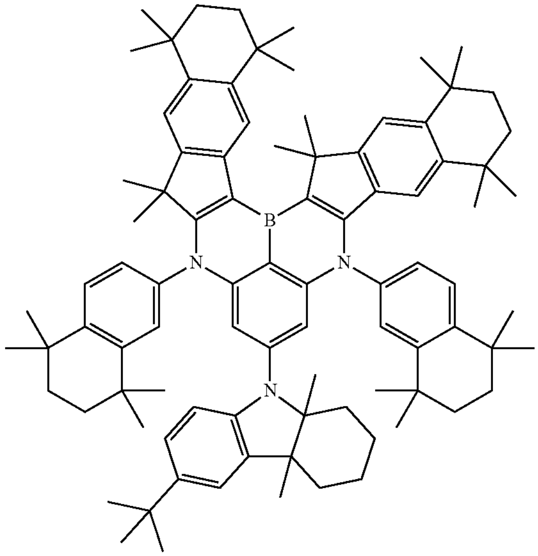
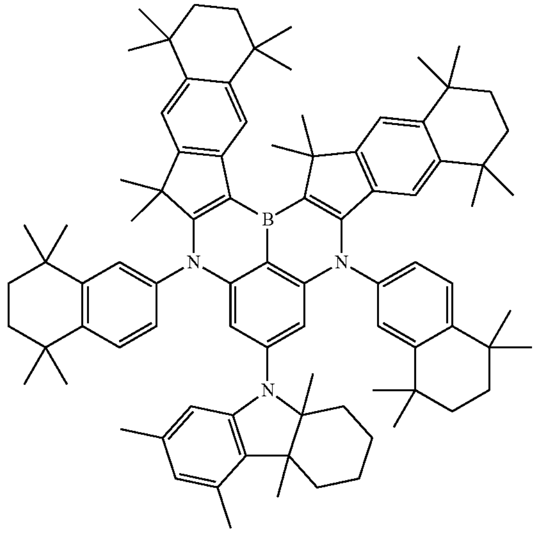
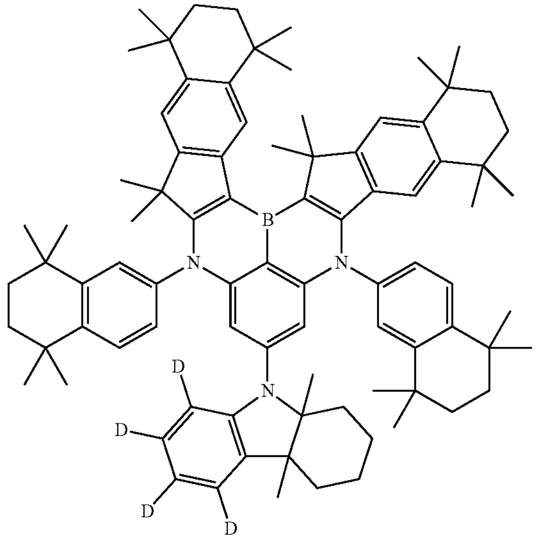

-continued
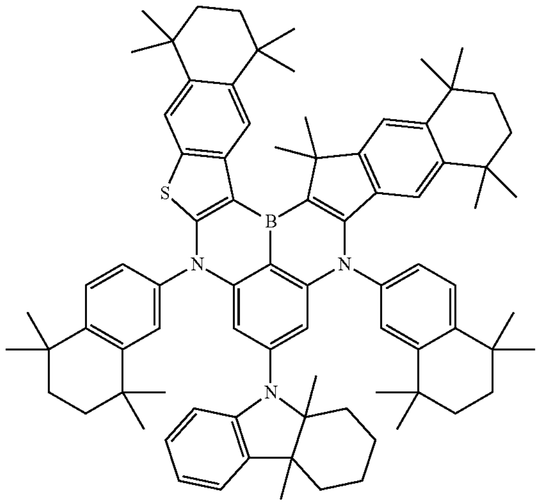
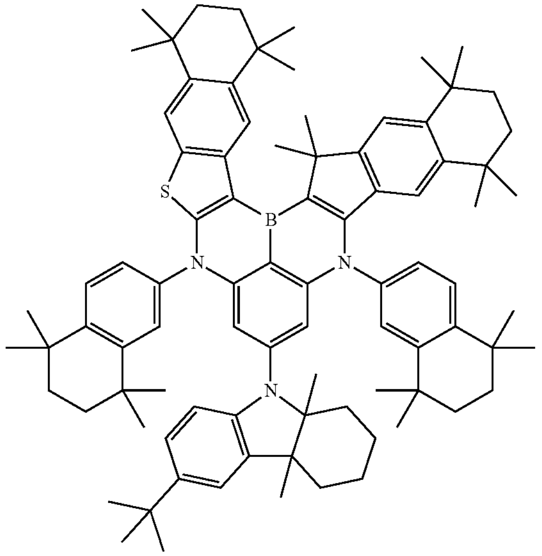
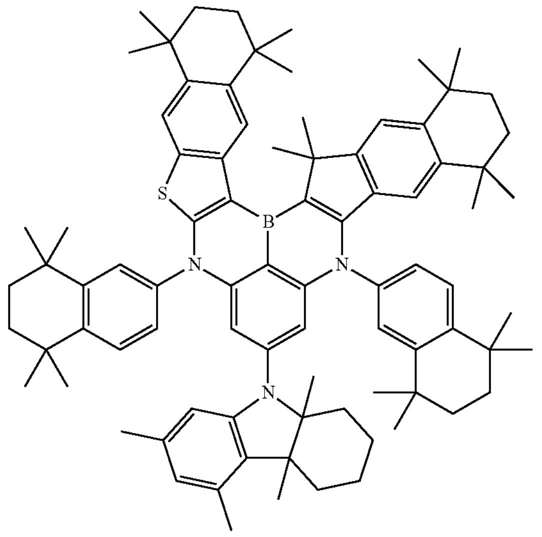
-continued
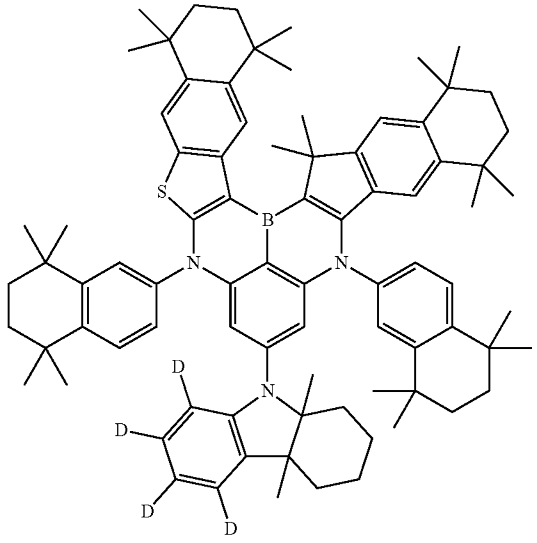
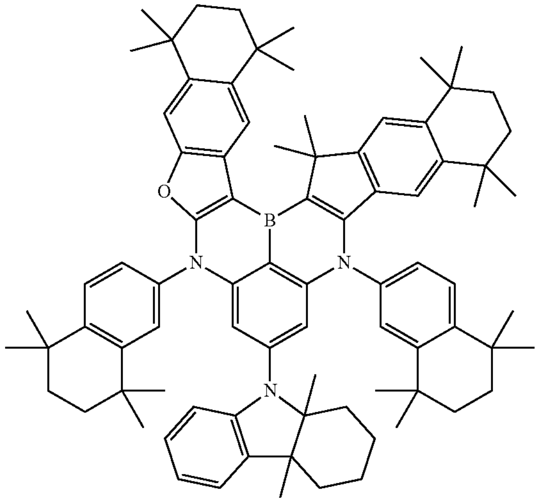
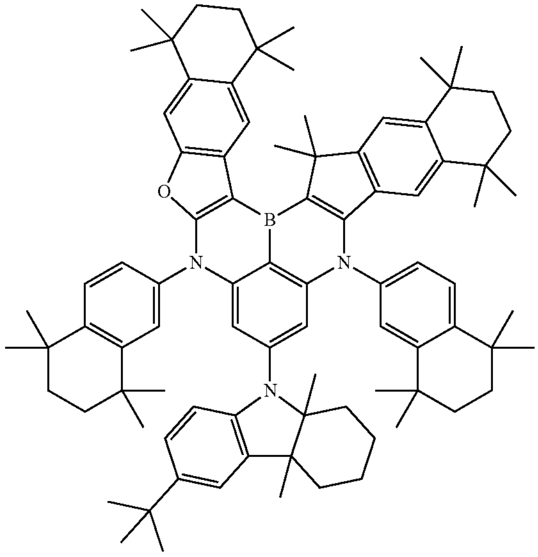

-continued
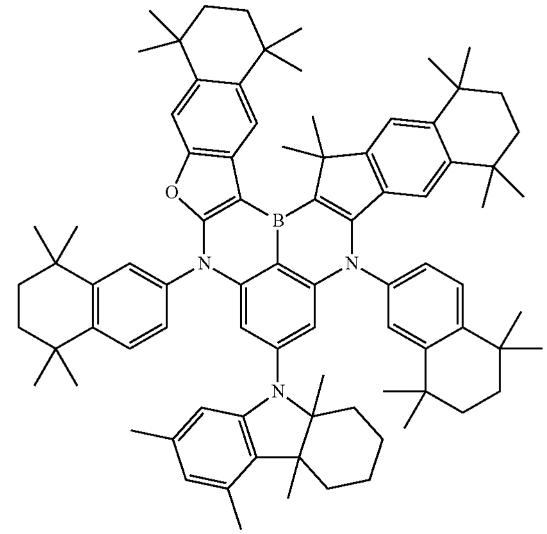
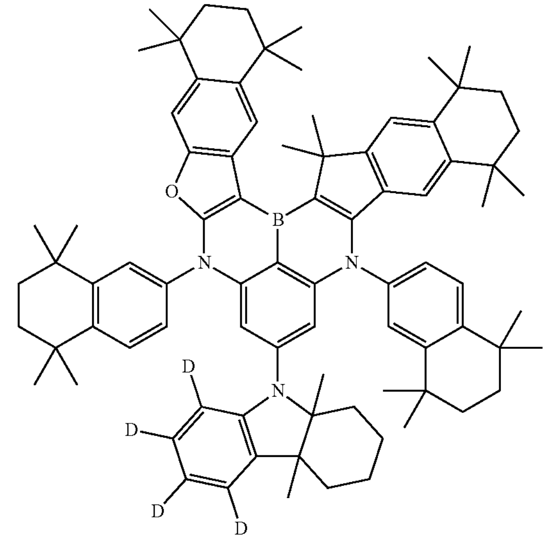
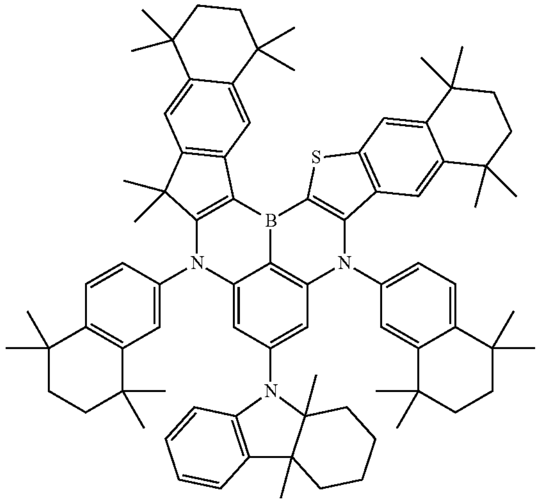
-continued
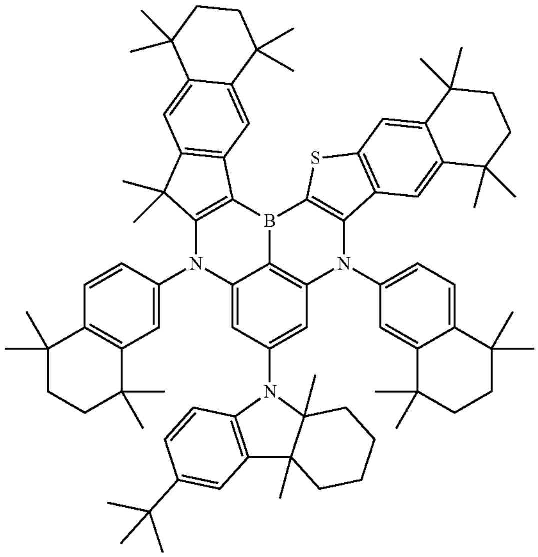
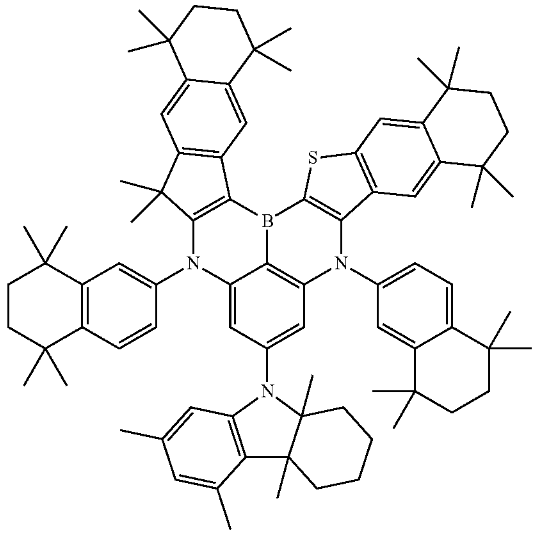
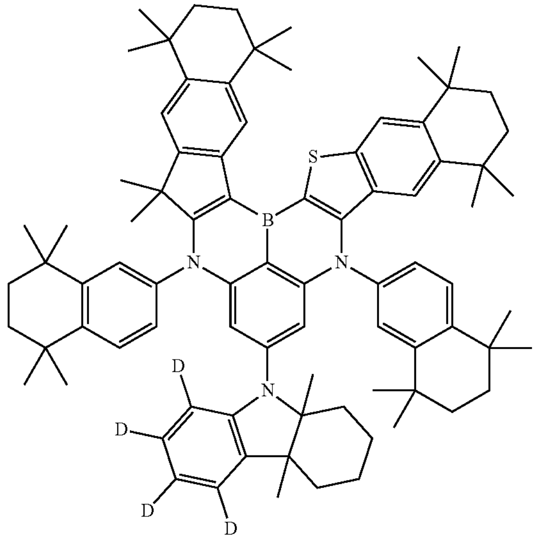

-continued
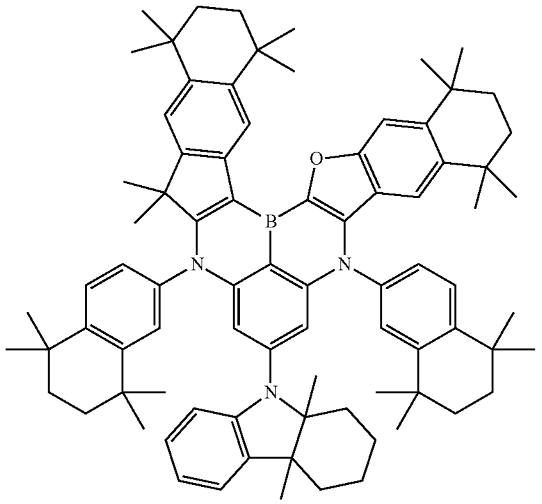
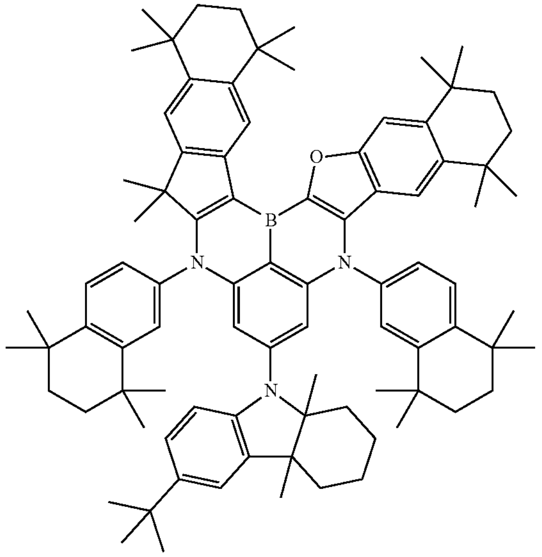
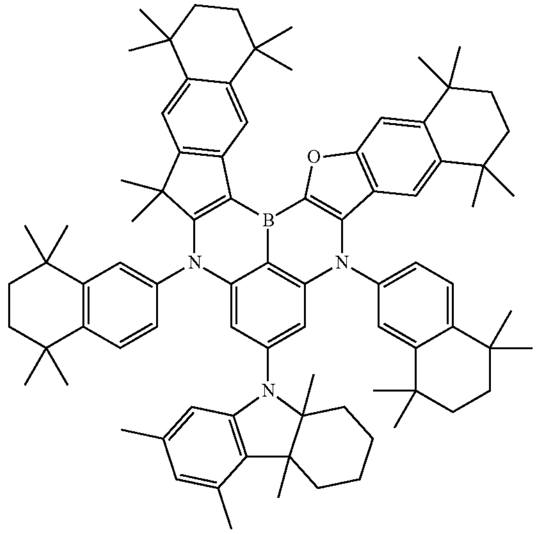
-continued
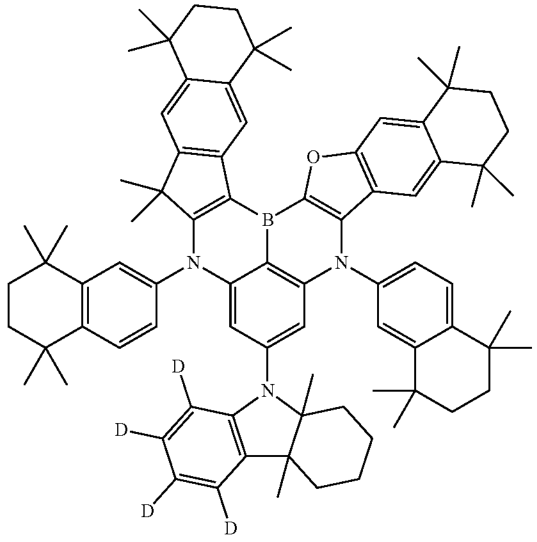
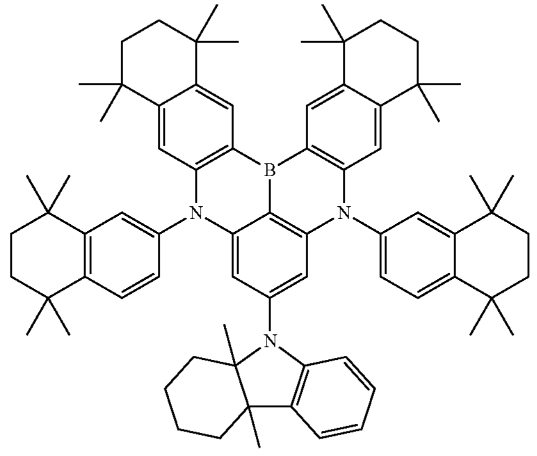
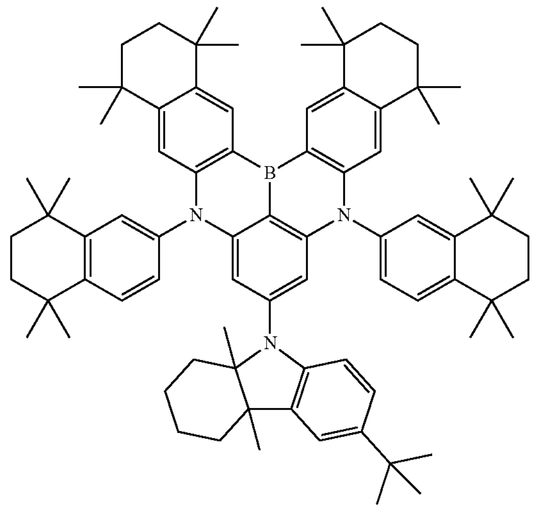

-continued
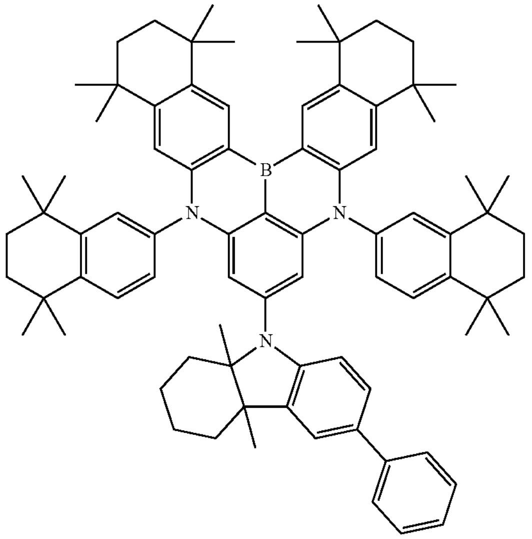
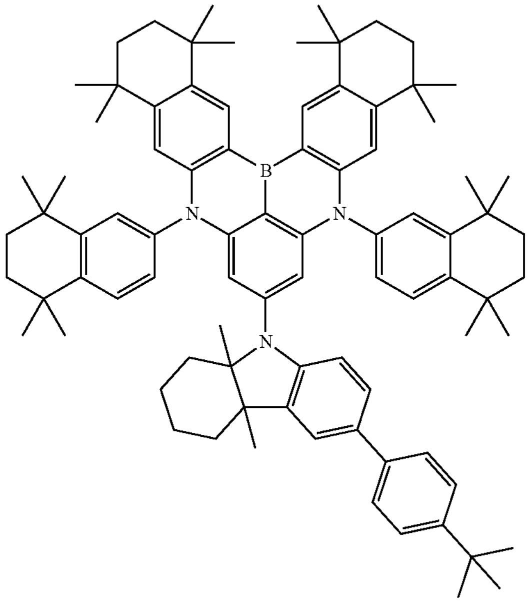
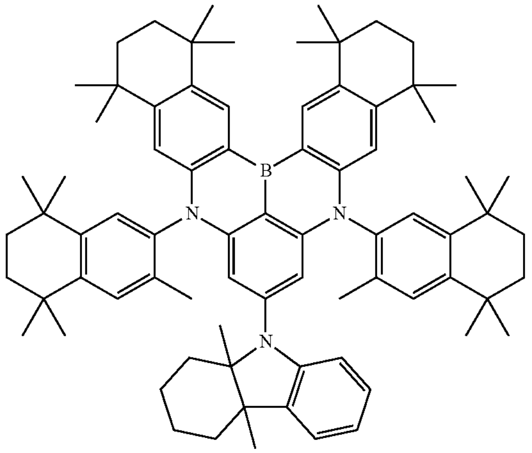
-continued
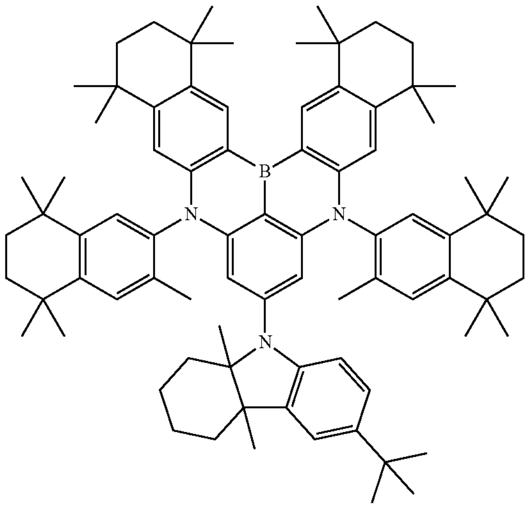
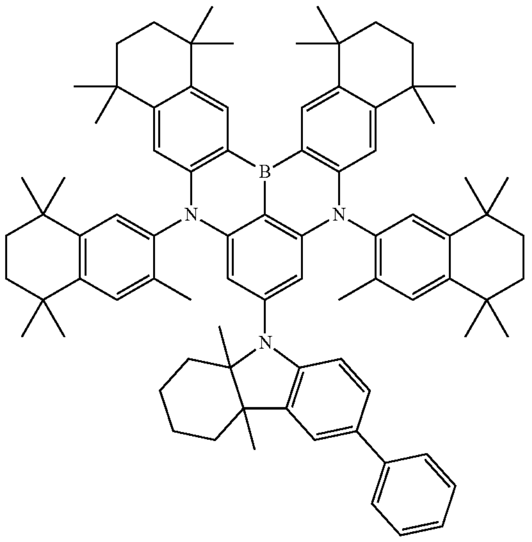
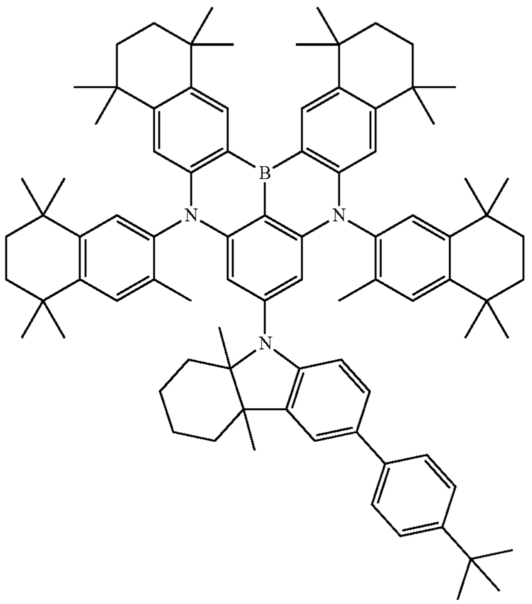

-continued
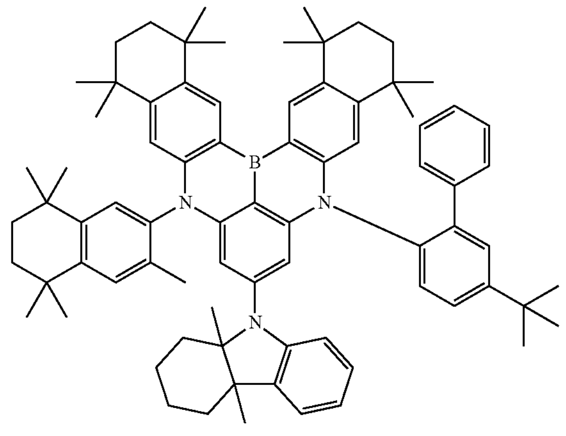
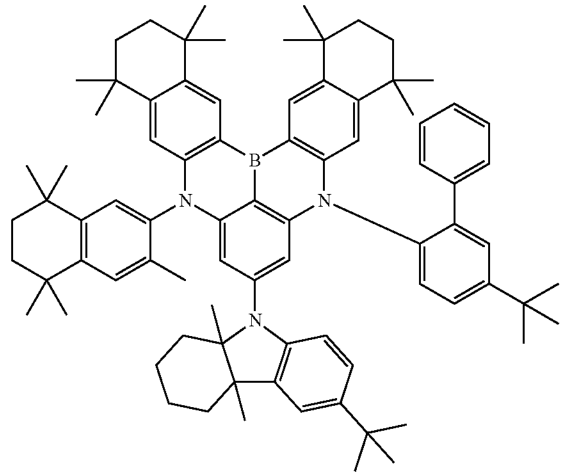
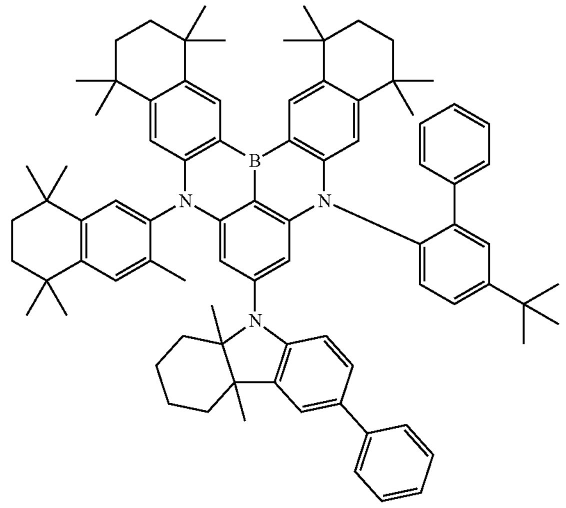
-continued
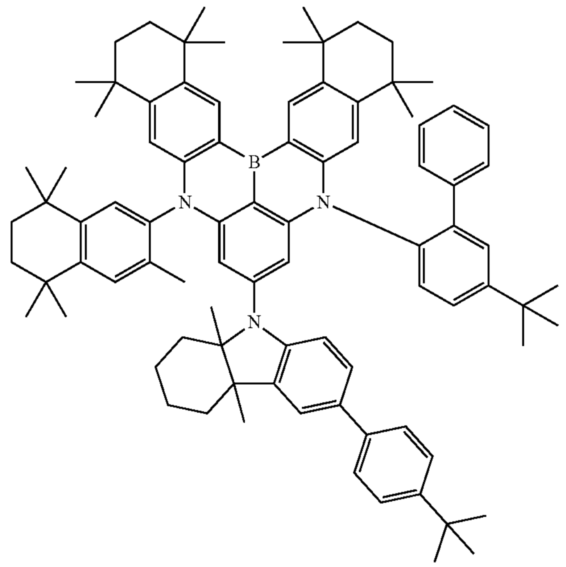
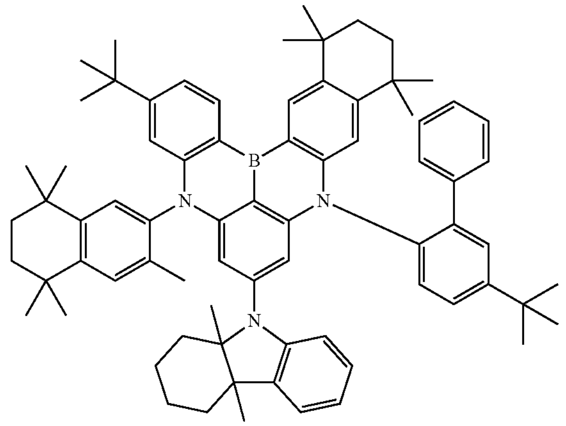
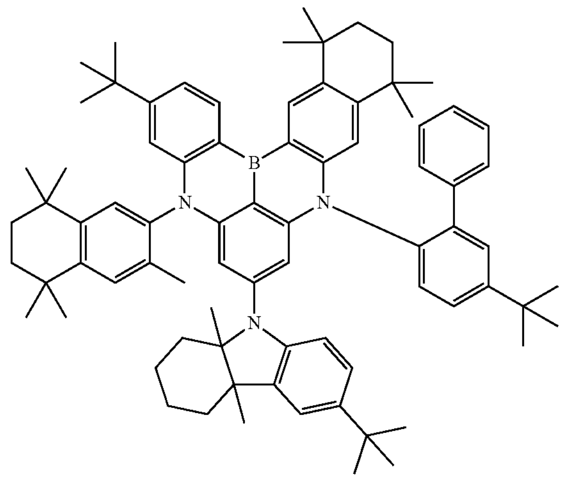

-continued
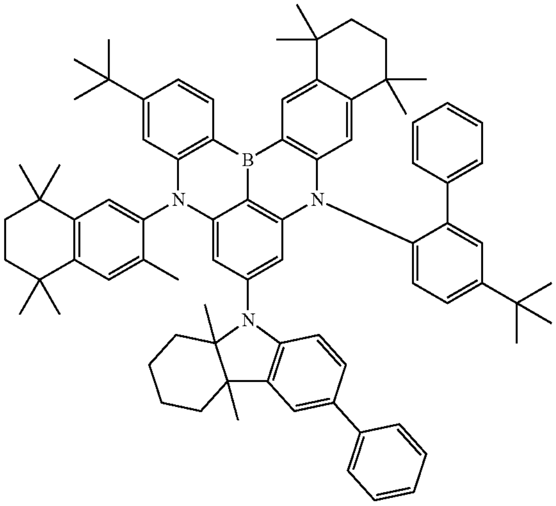
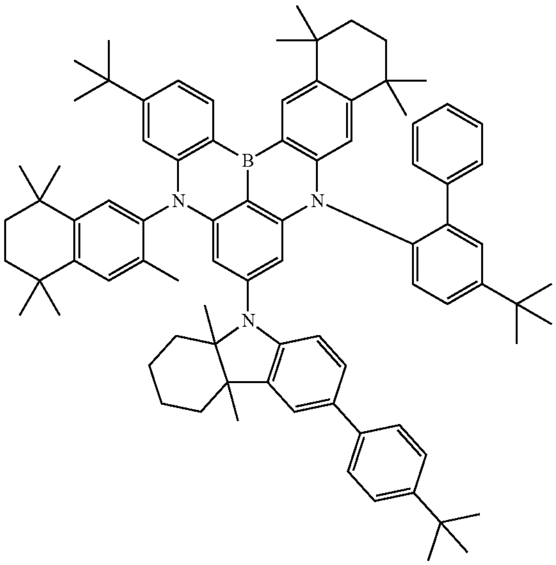
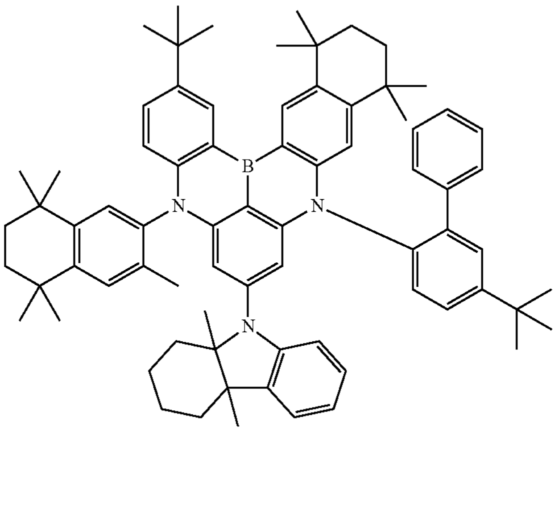
-continued
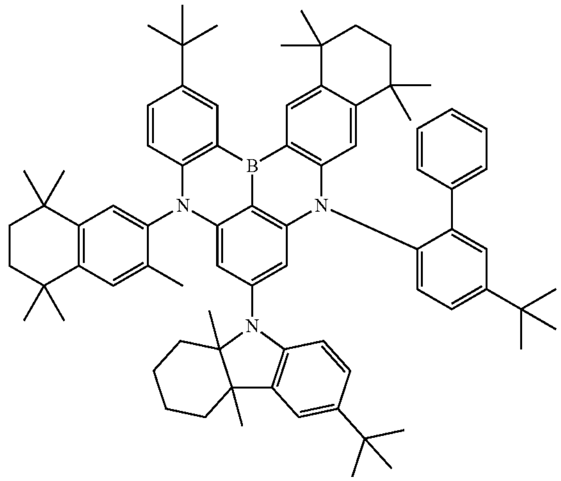
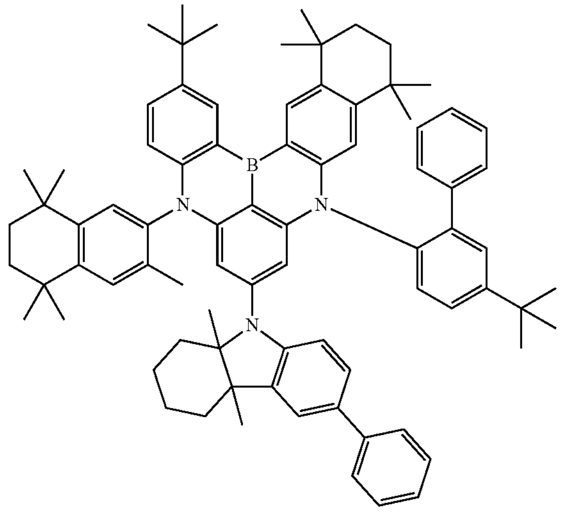
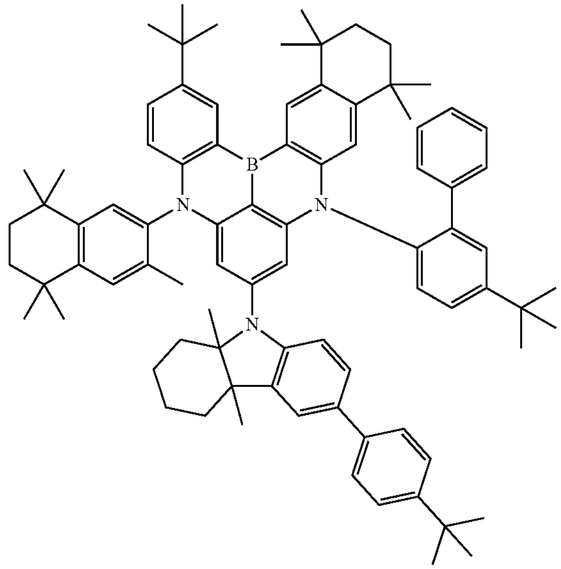

-continued
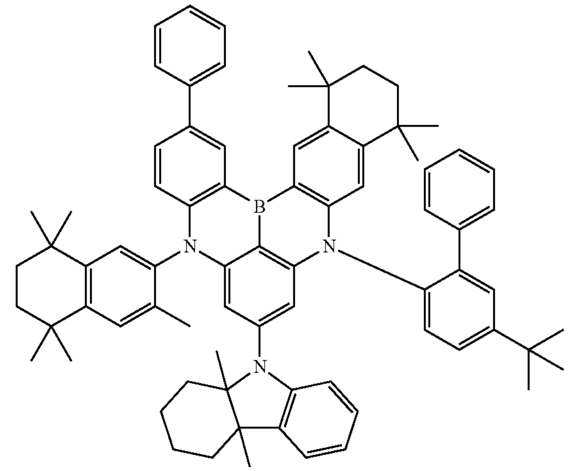
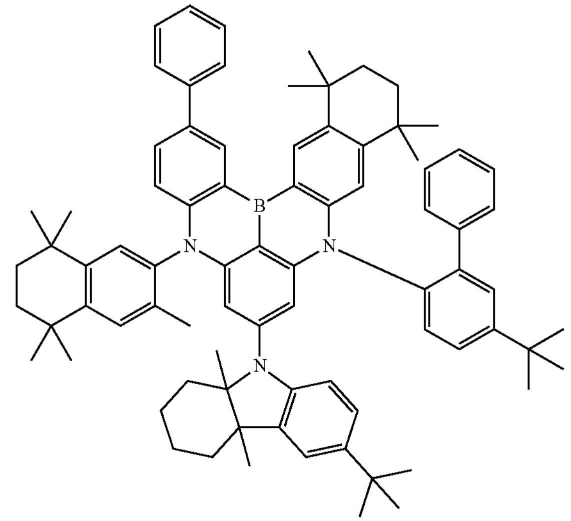
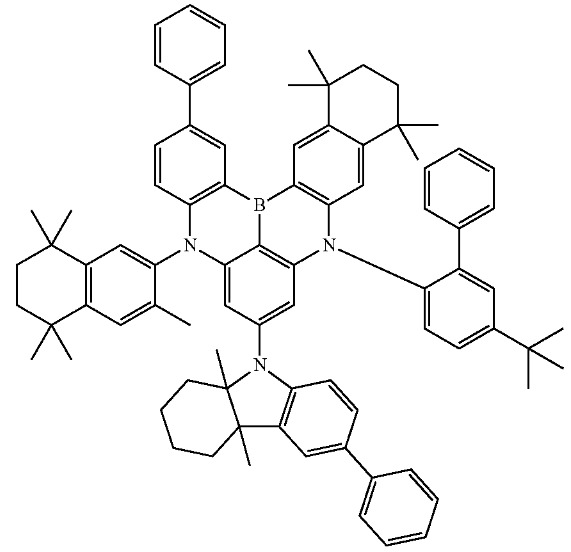
-continued
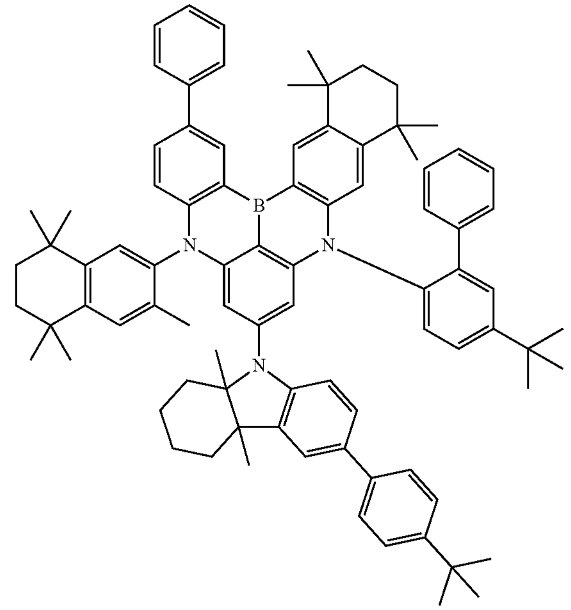
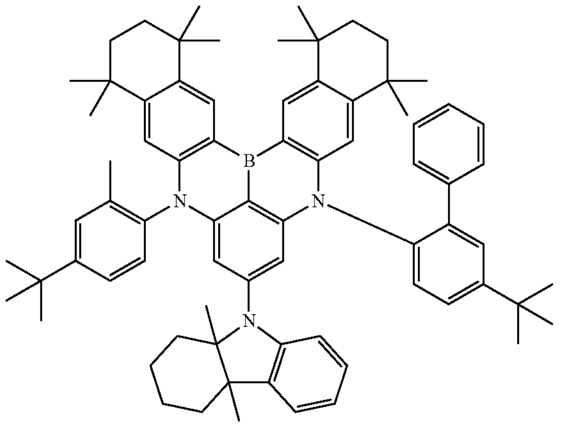
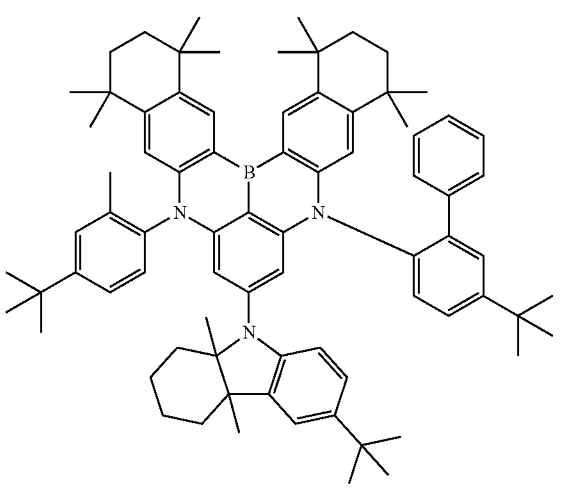

-continued
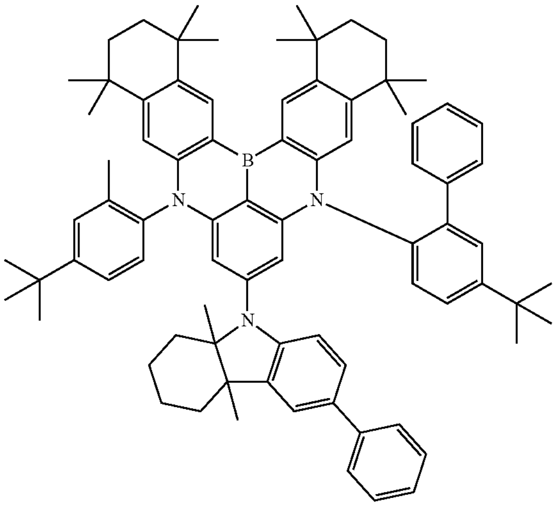
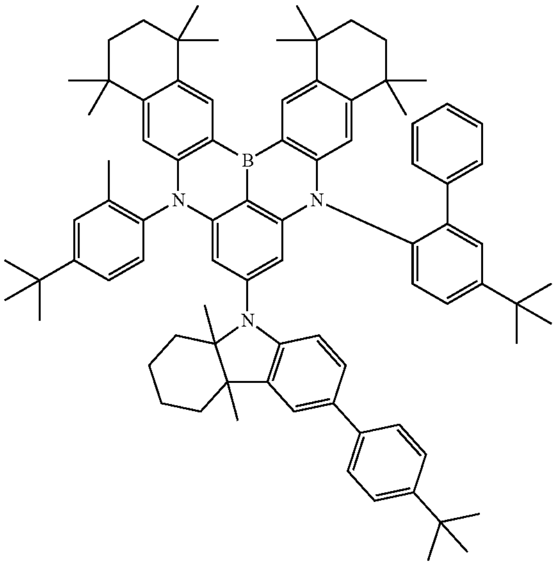
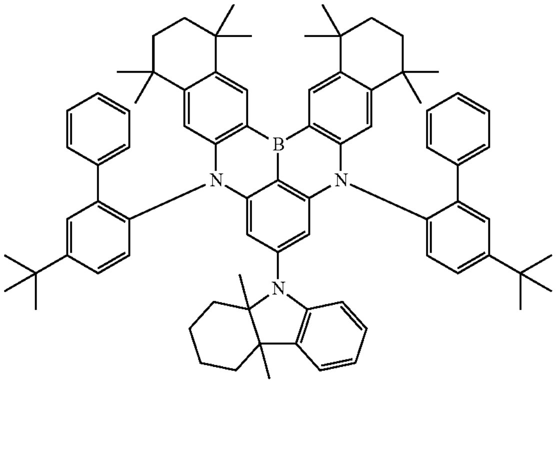
-continued
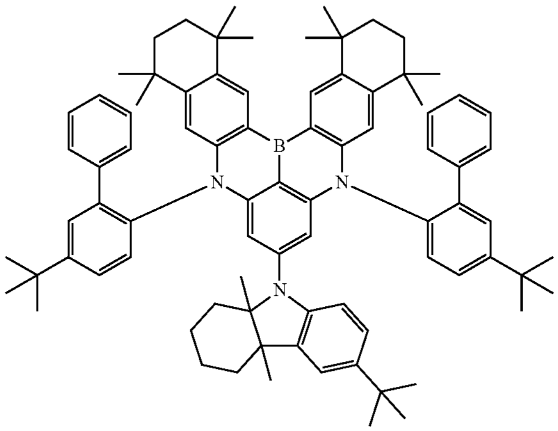
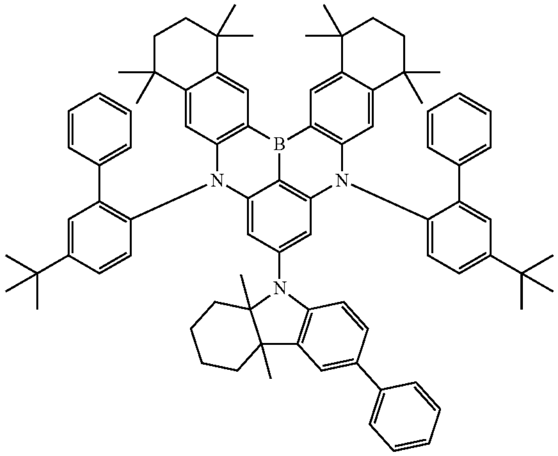
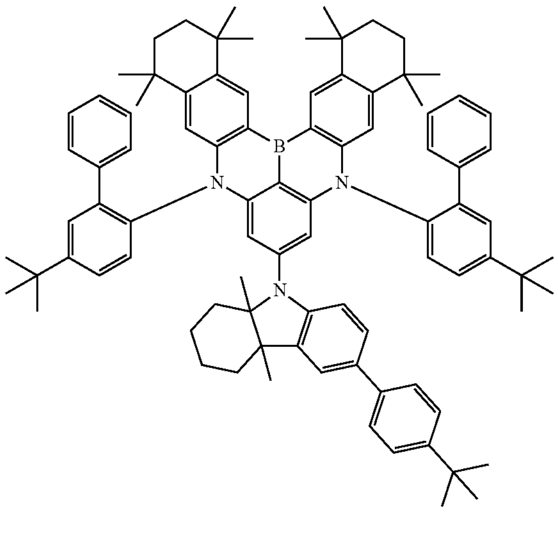

-continued
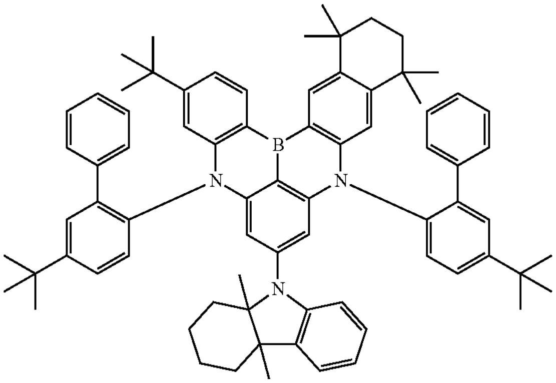
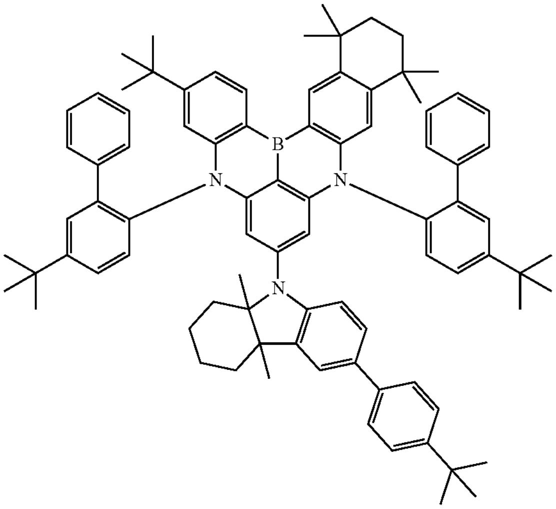
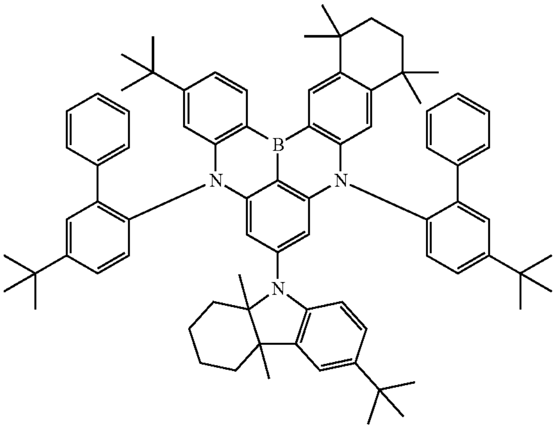
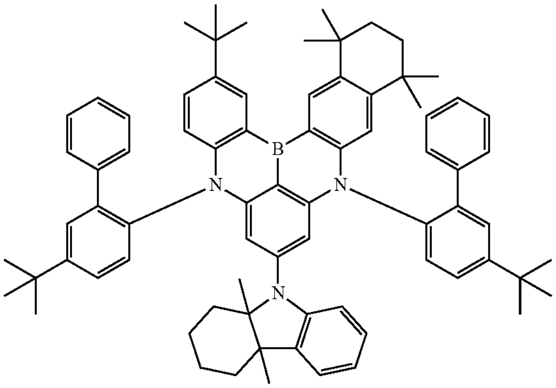
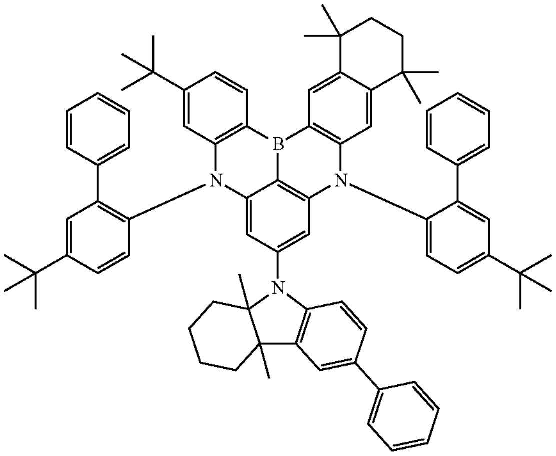
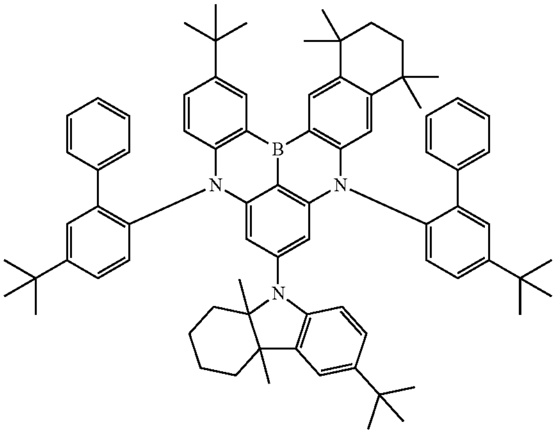
-continued -continued
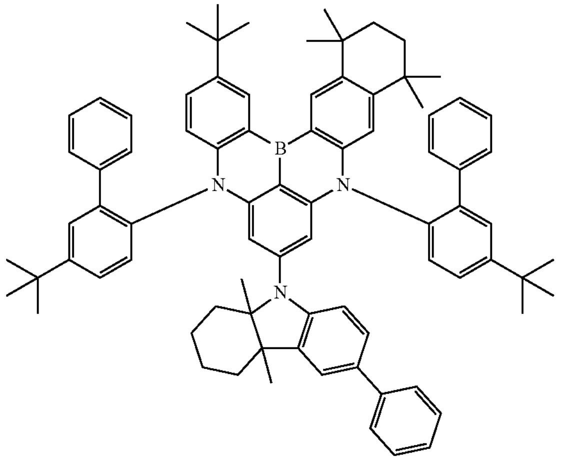
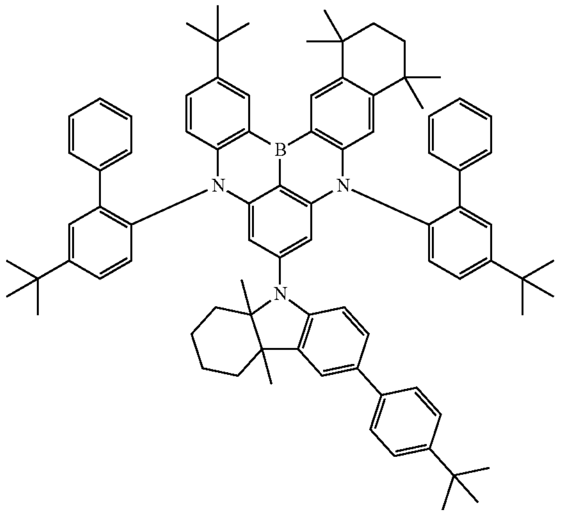
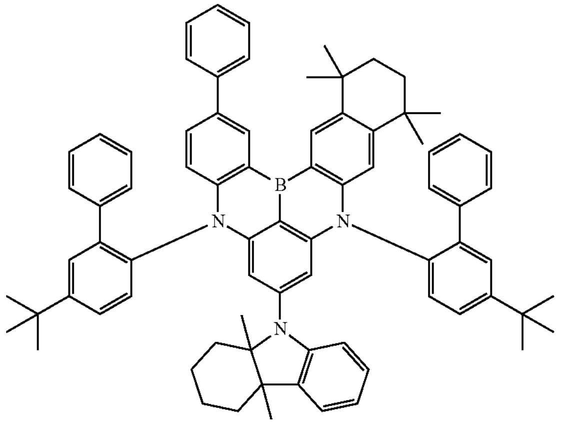
-continued
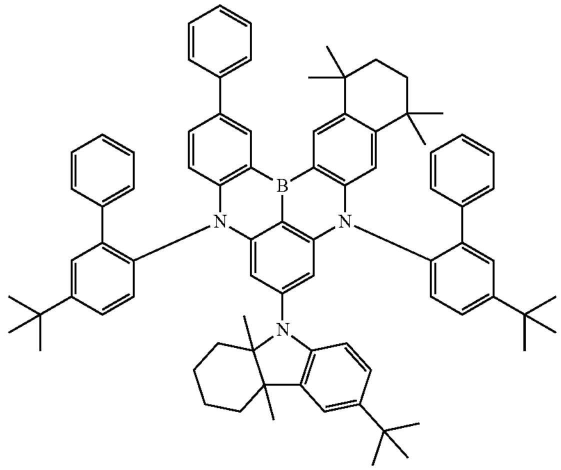
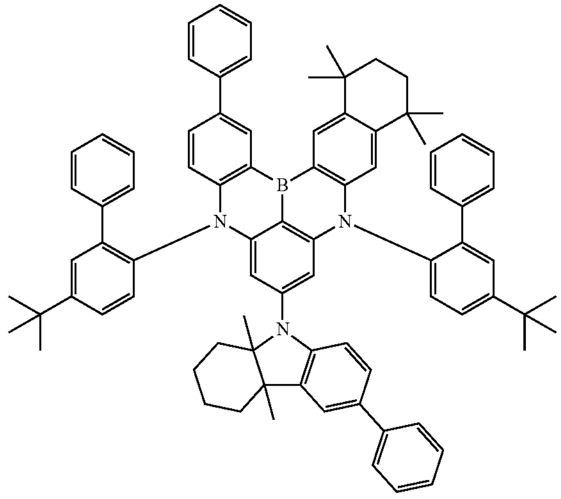
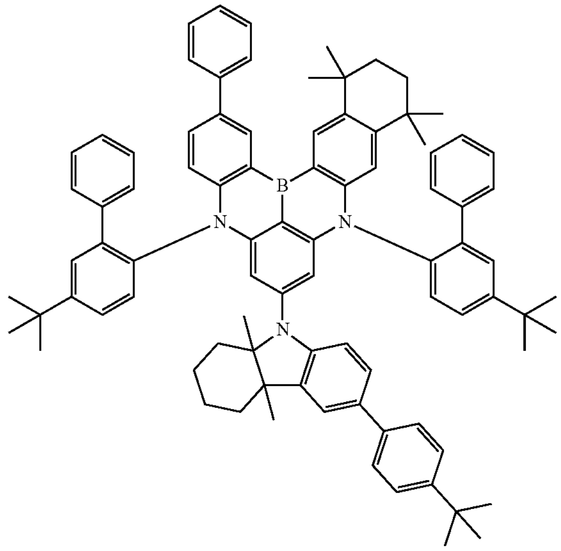

-continued
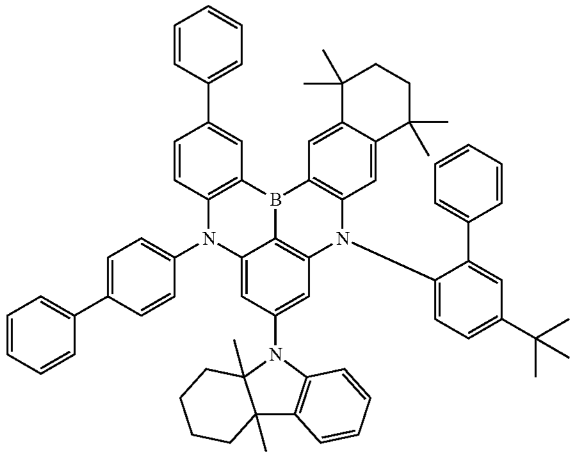
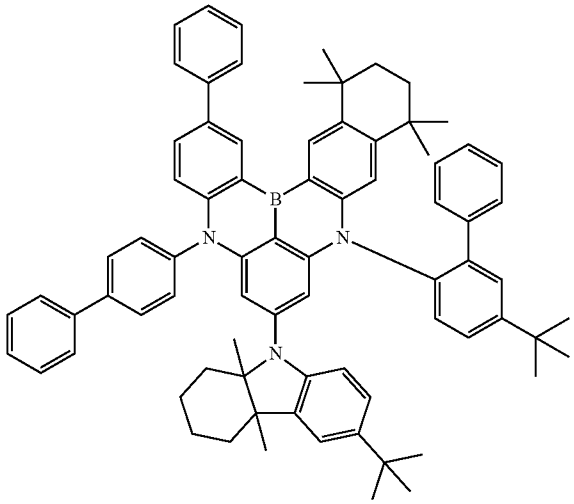
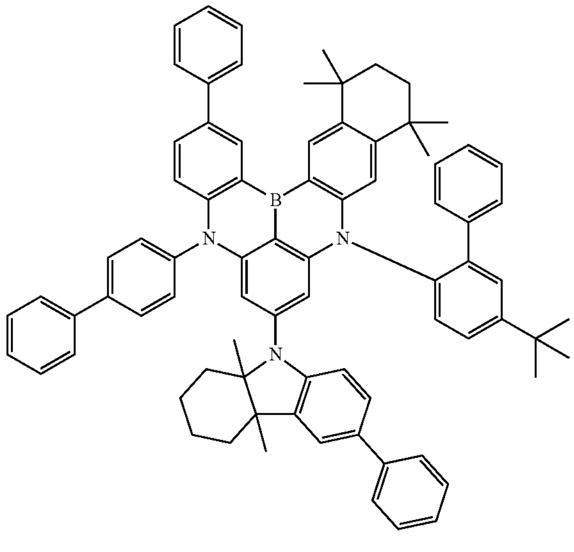
-continued
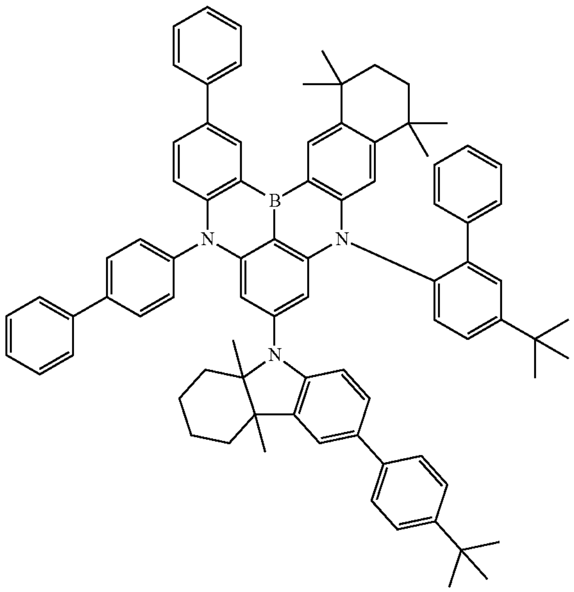
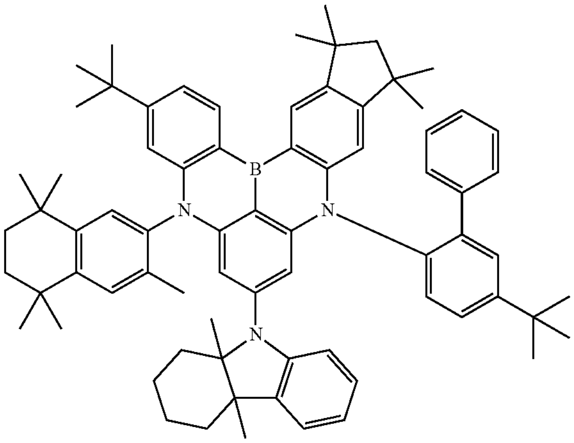
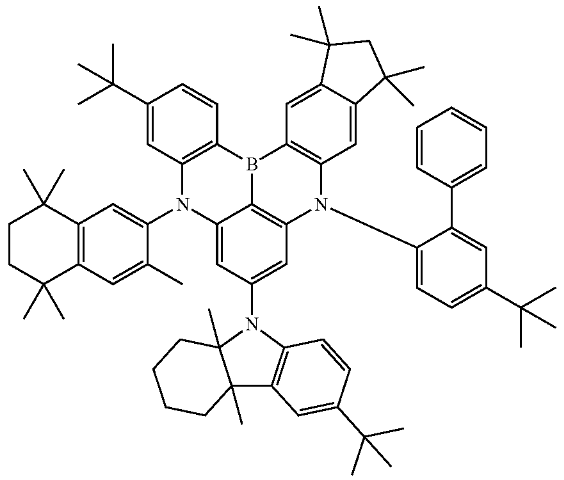

-continued
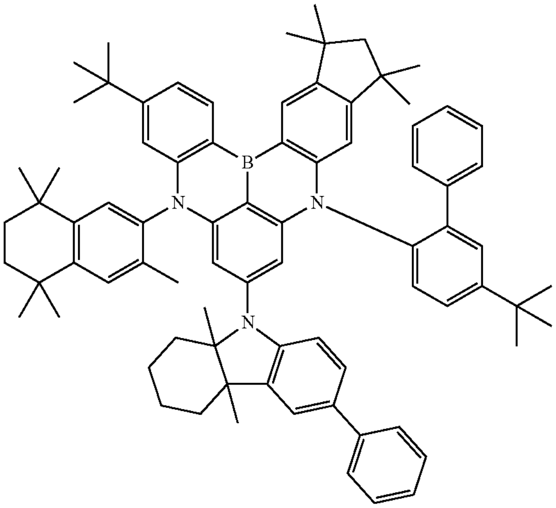
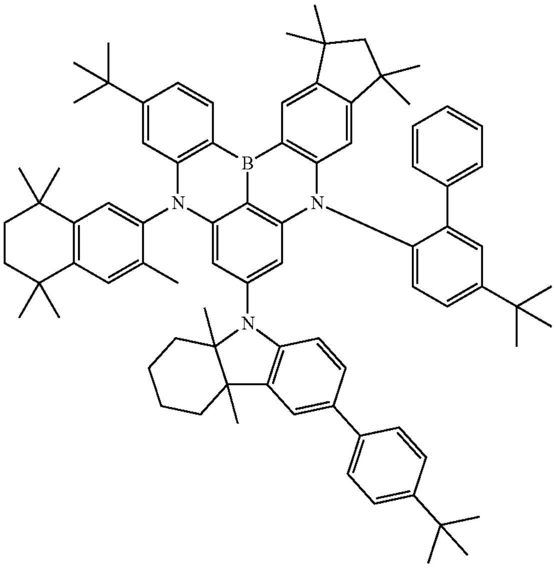
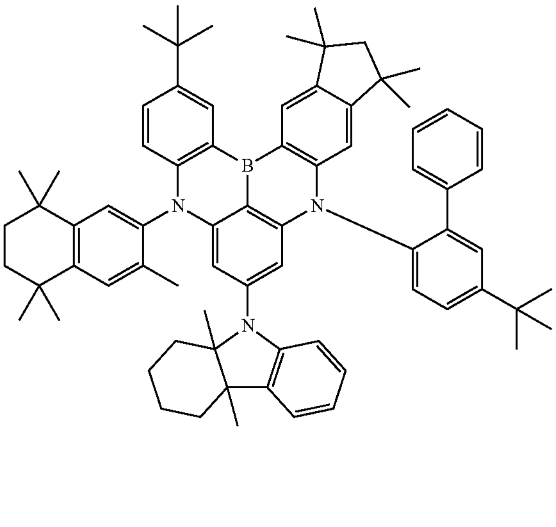
-continued
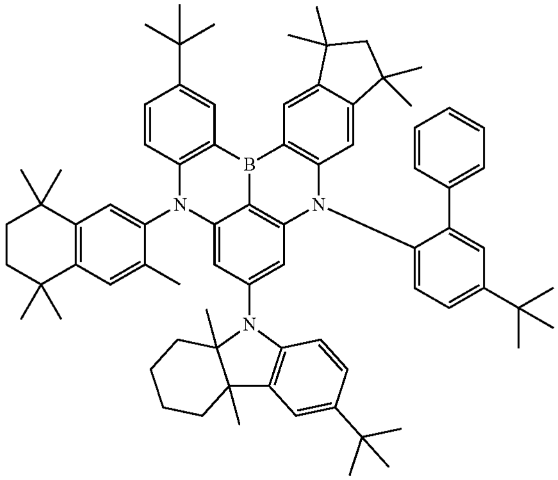
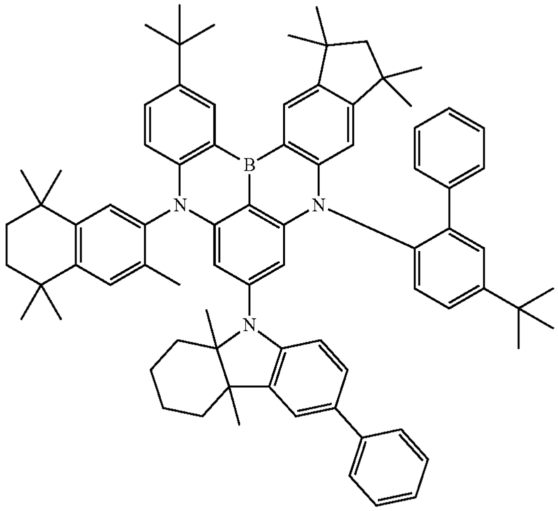
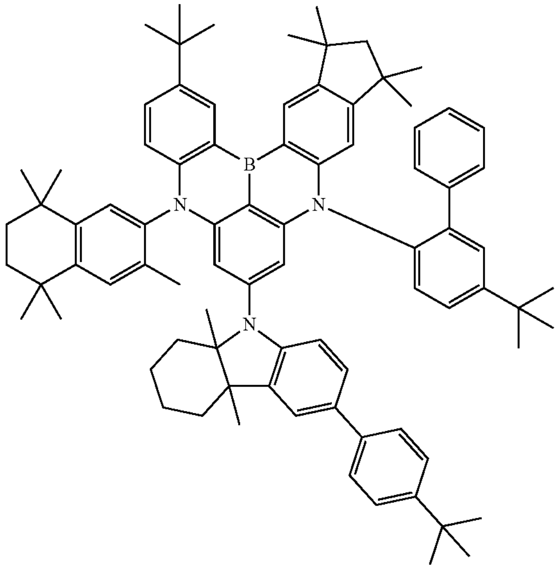

-continued
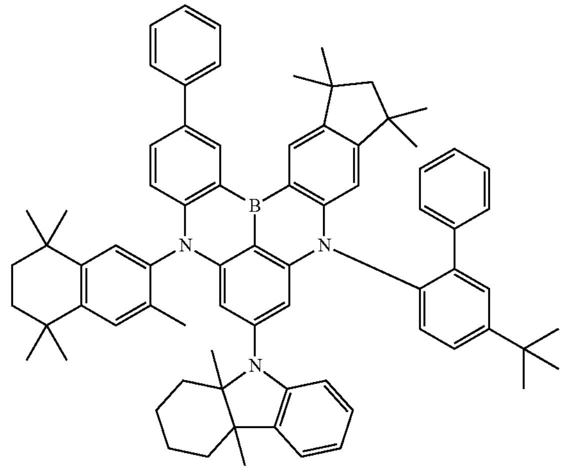
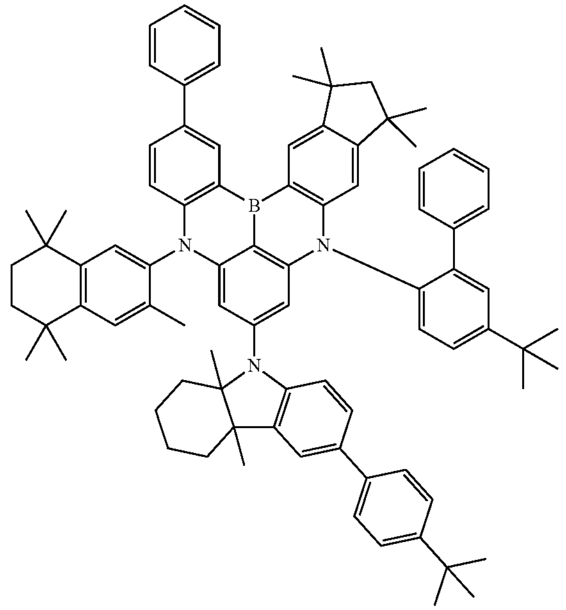
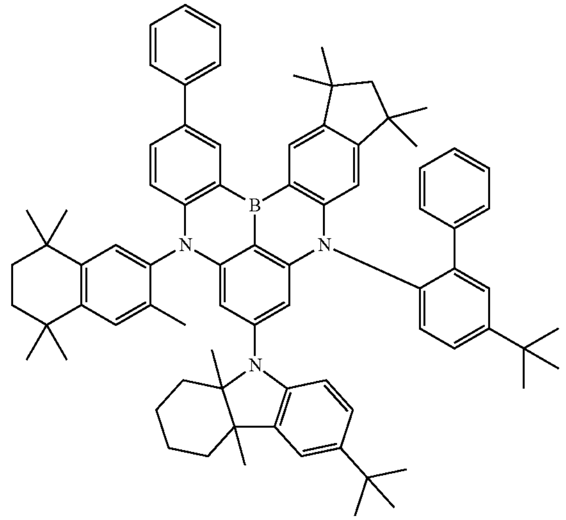
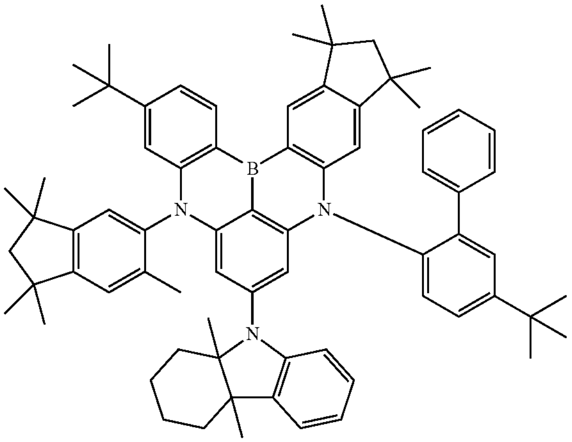
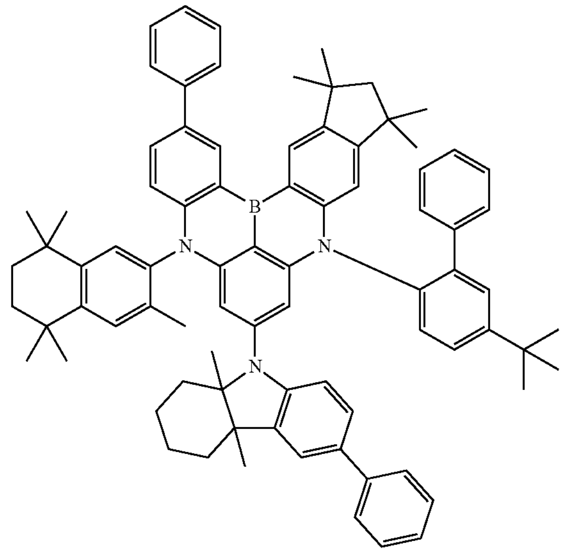
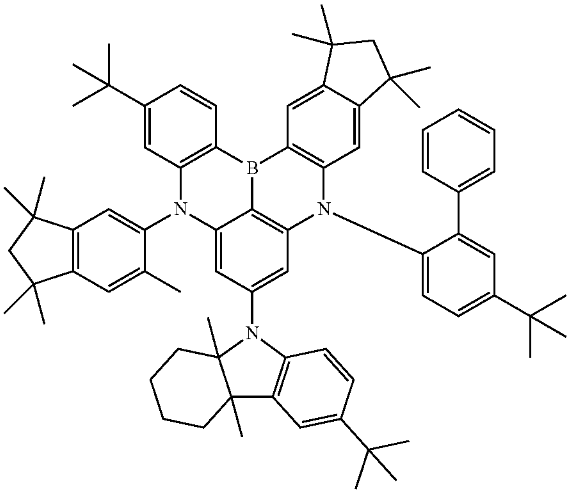

-continued
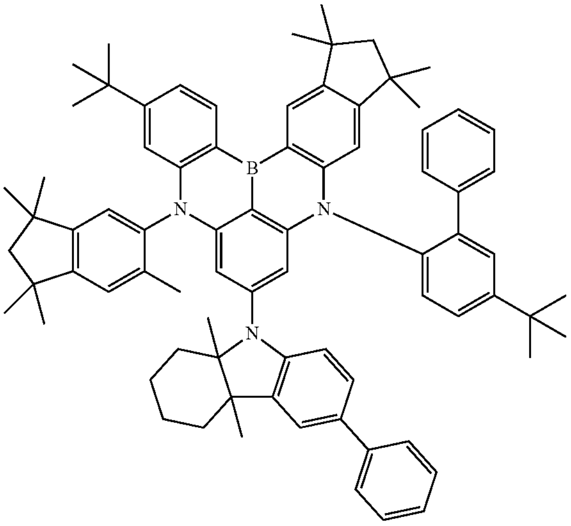
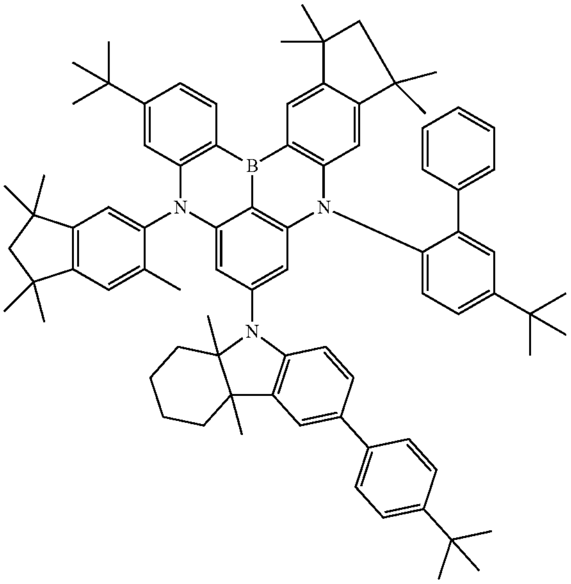
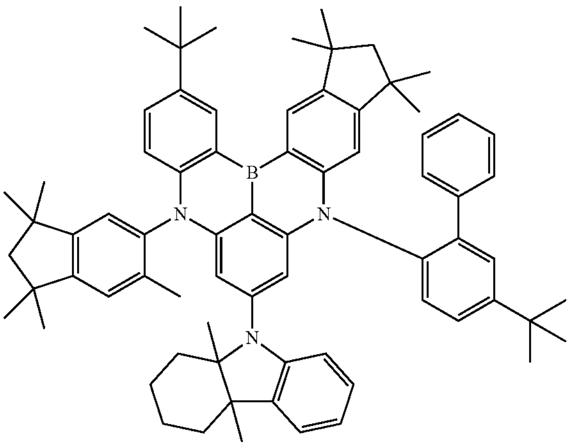
-continued
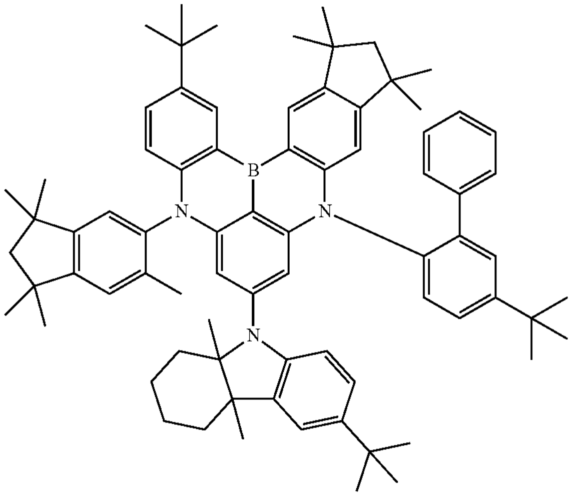
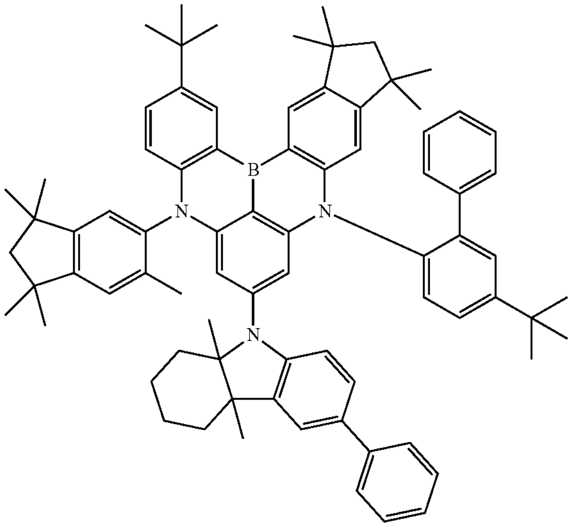
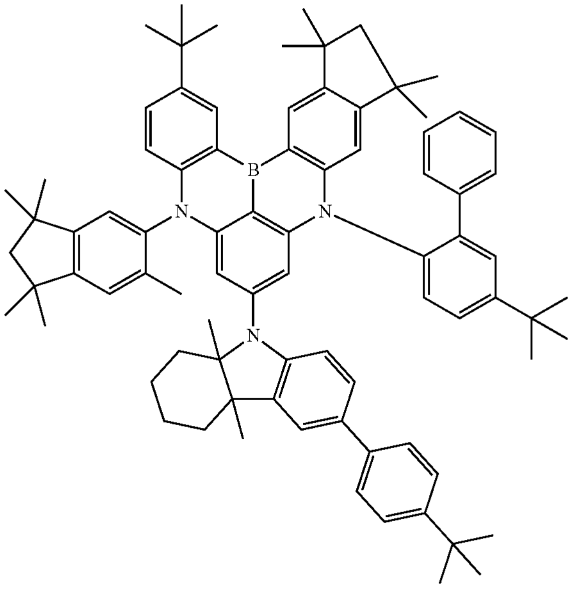

-continued
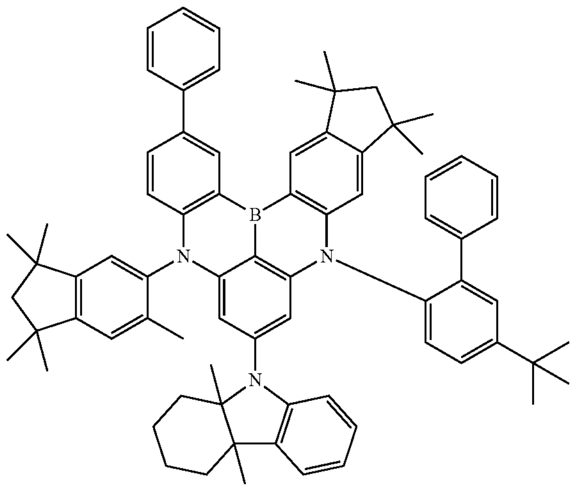
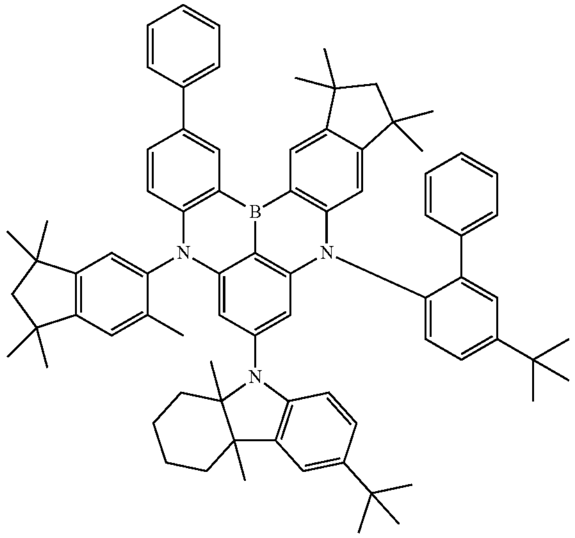
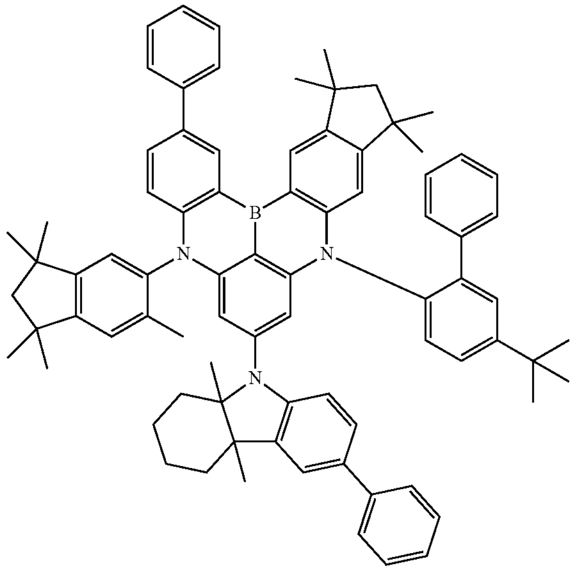
-continued
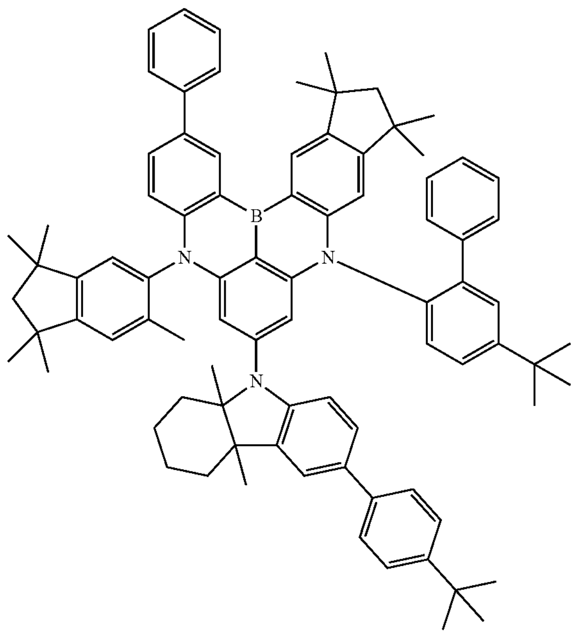
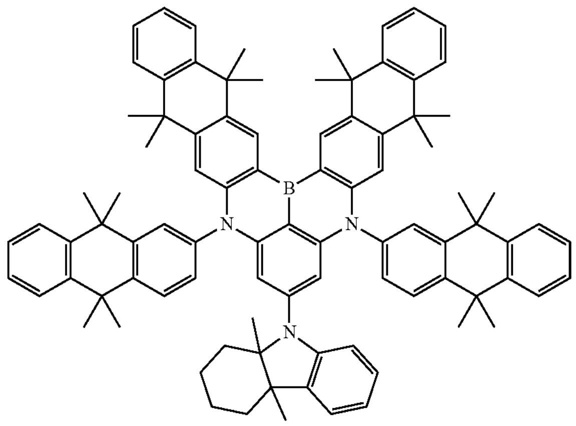
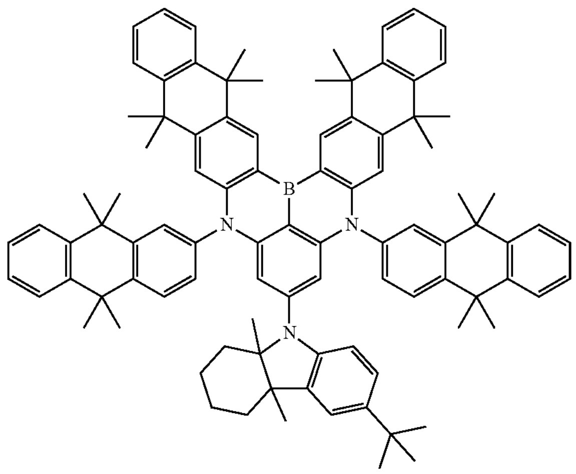

-continued
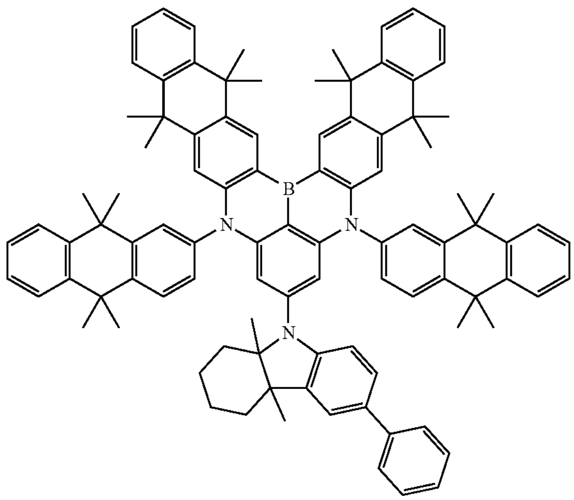
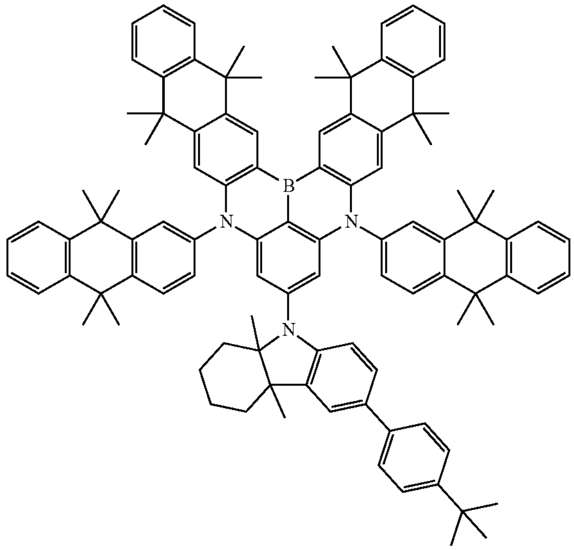
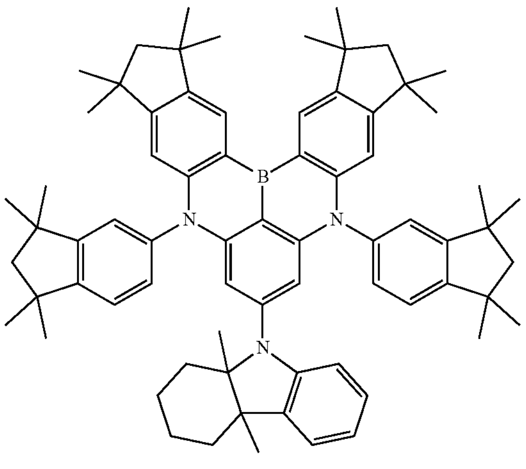
-continued
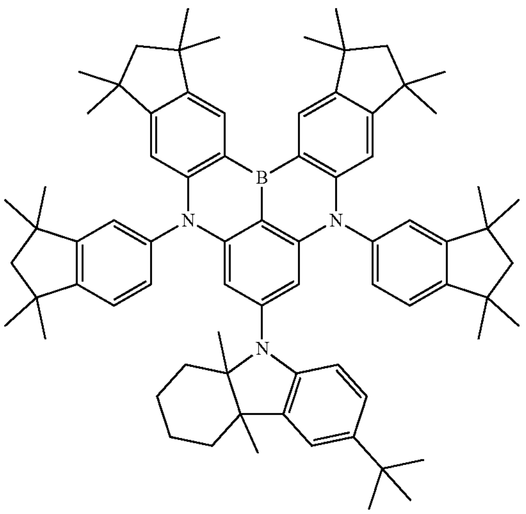
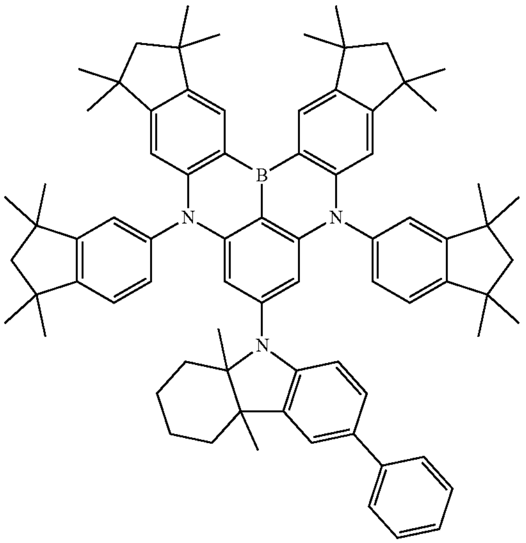
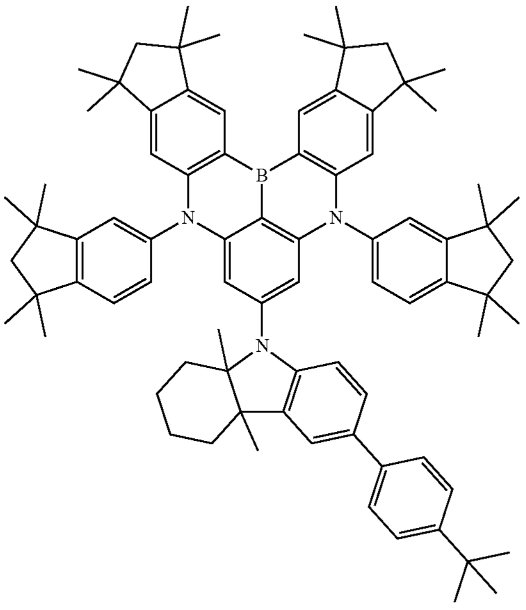

-continued
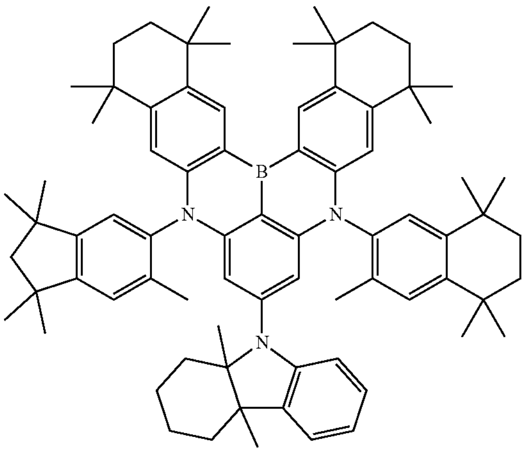
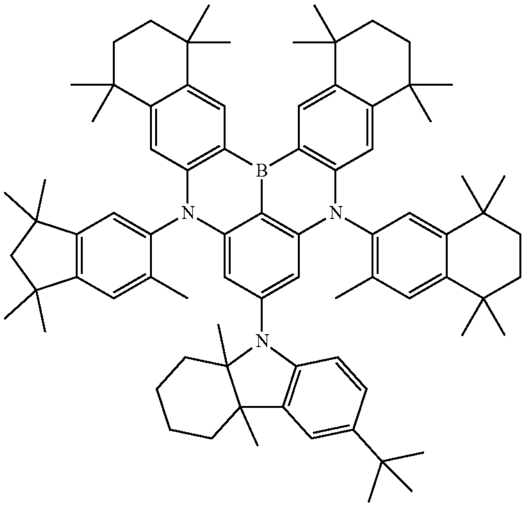
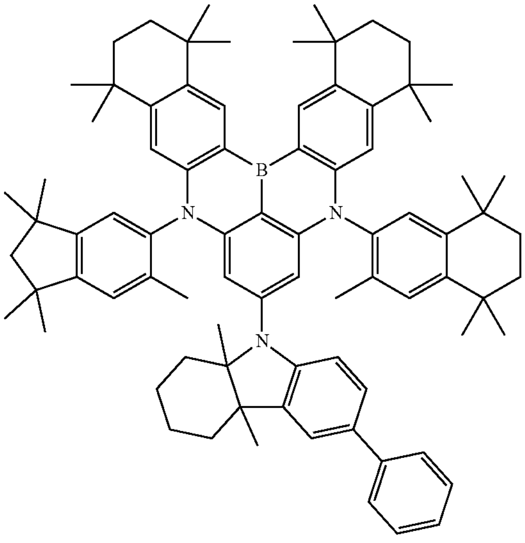
-continued
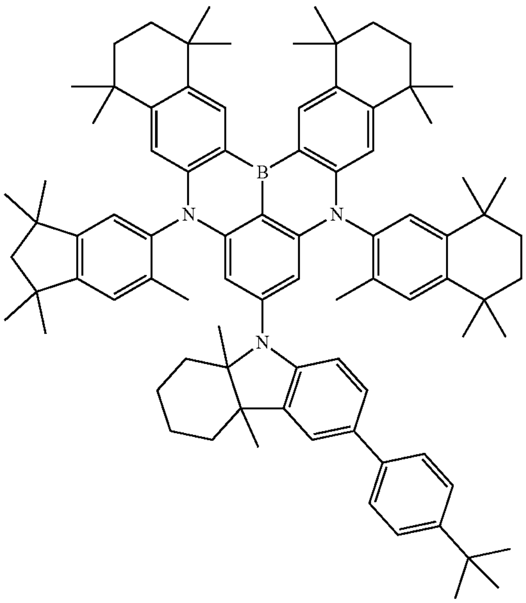
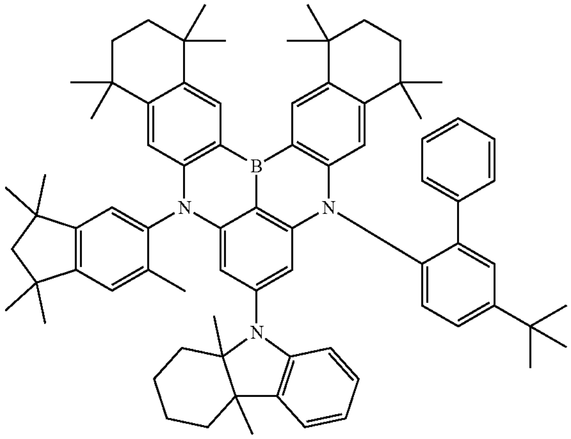
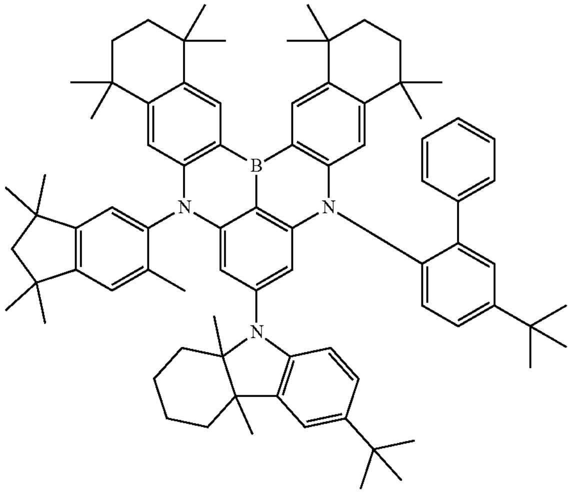

-continued
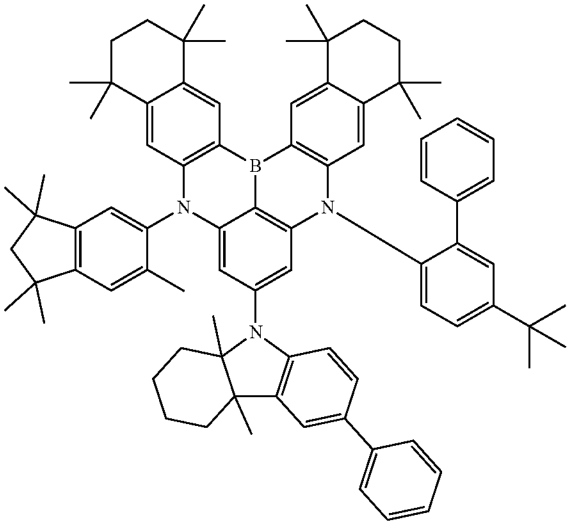
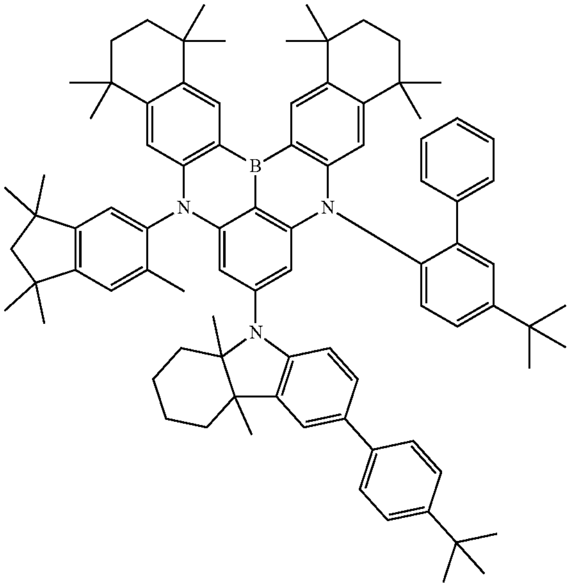
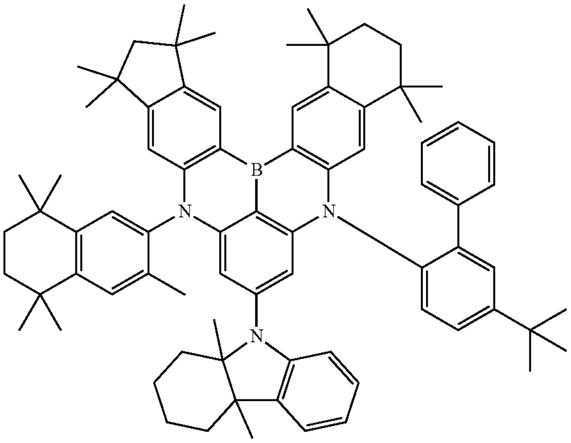
-continued
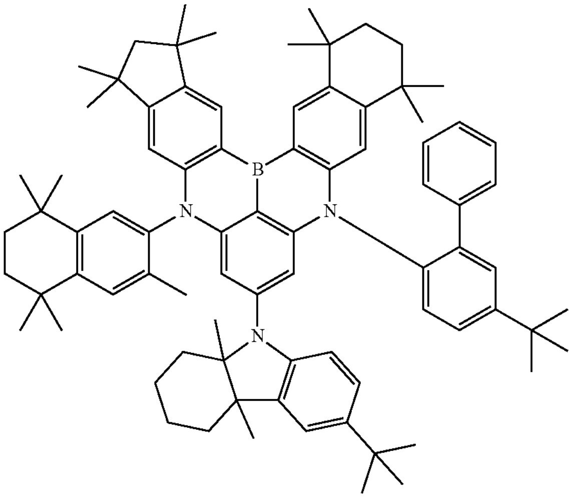
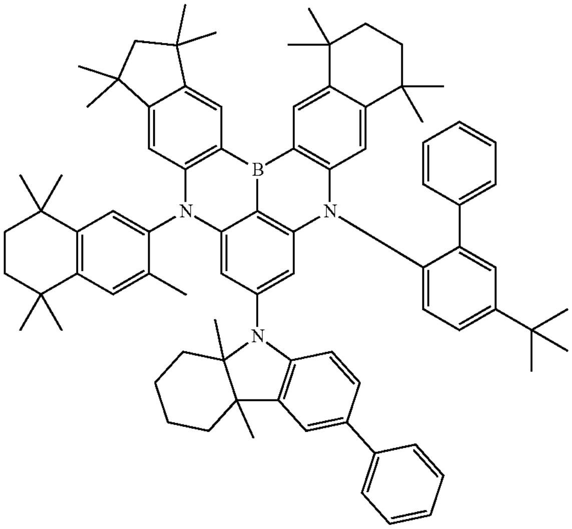
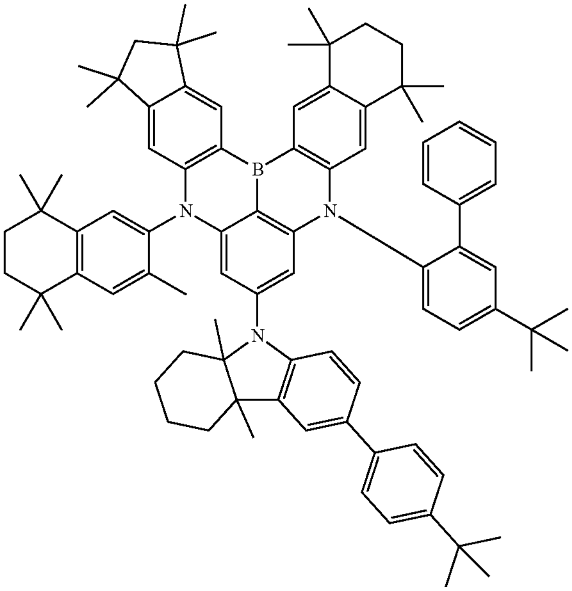

-continued
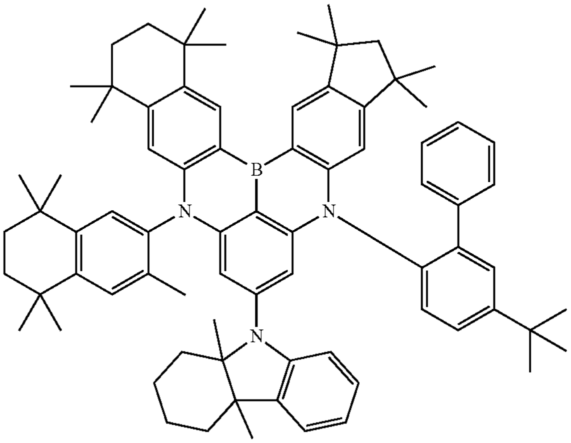
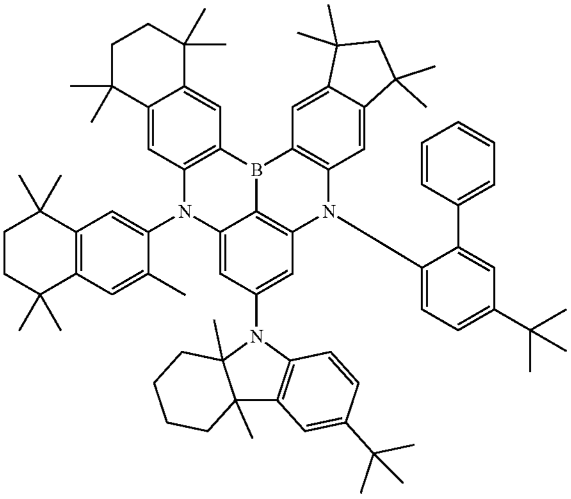
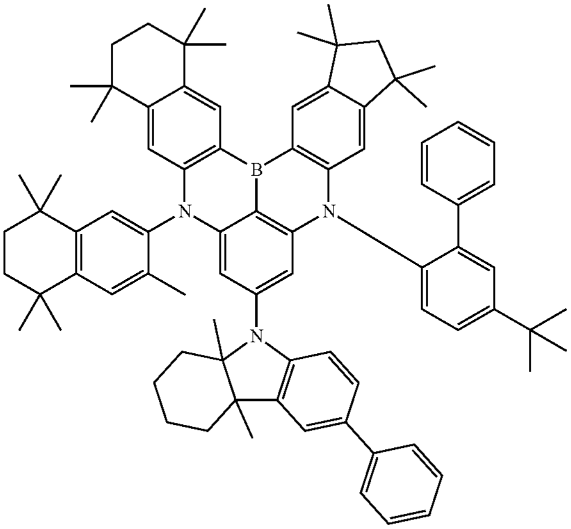
-continued
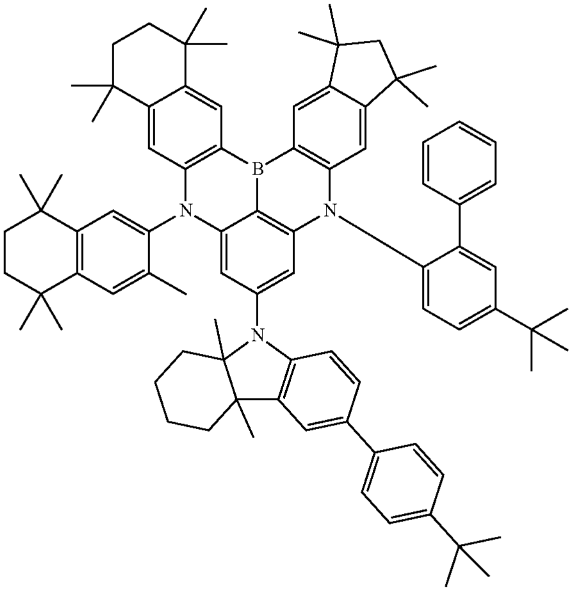
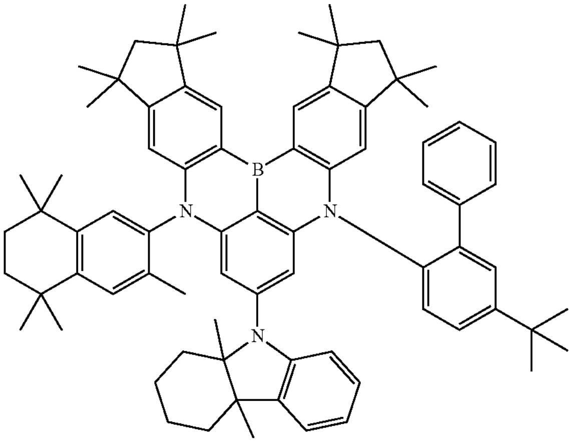
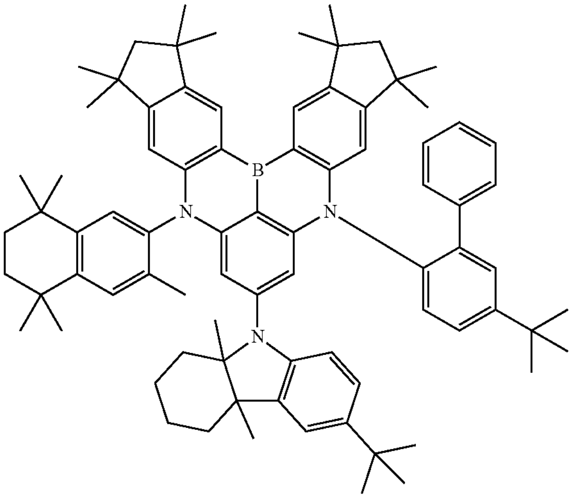

-continued
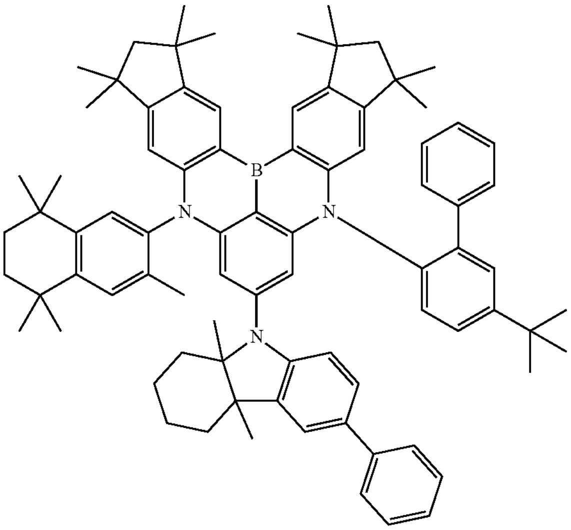
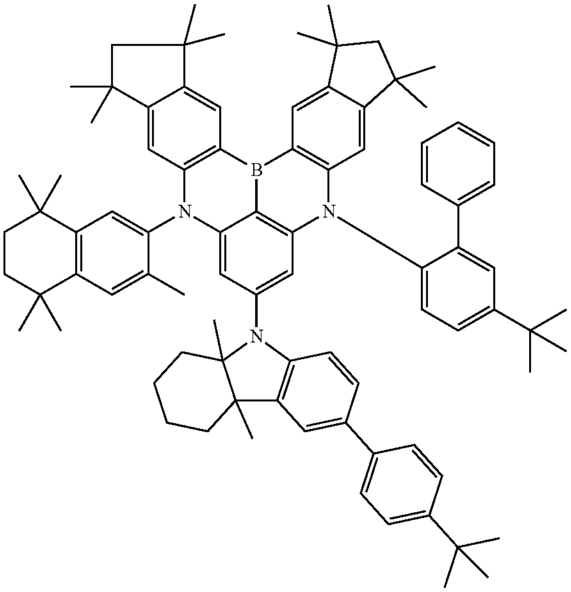
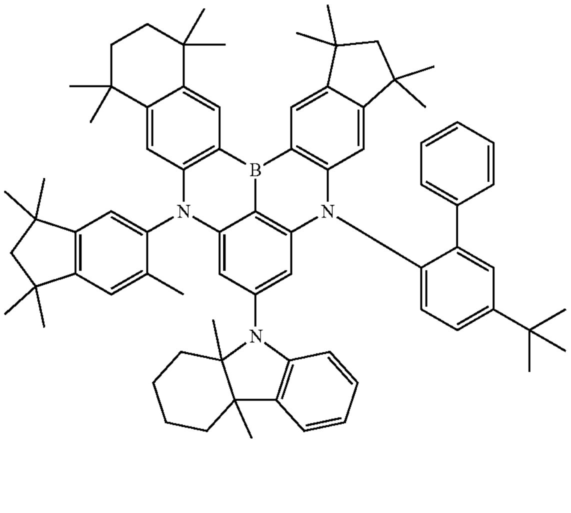
-continued
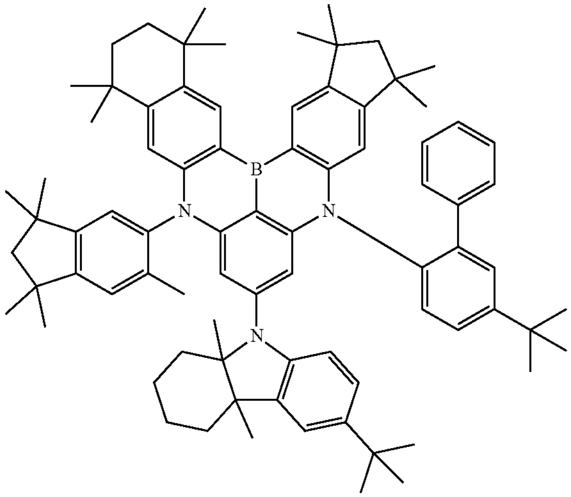
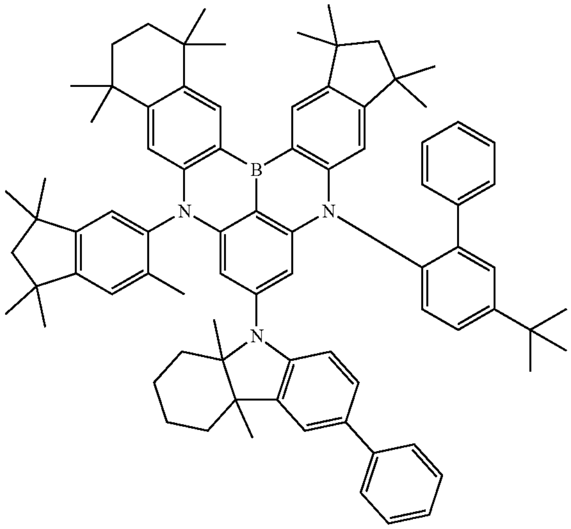
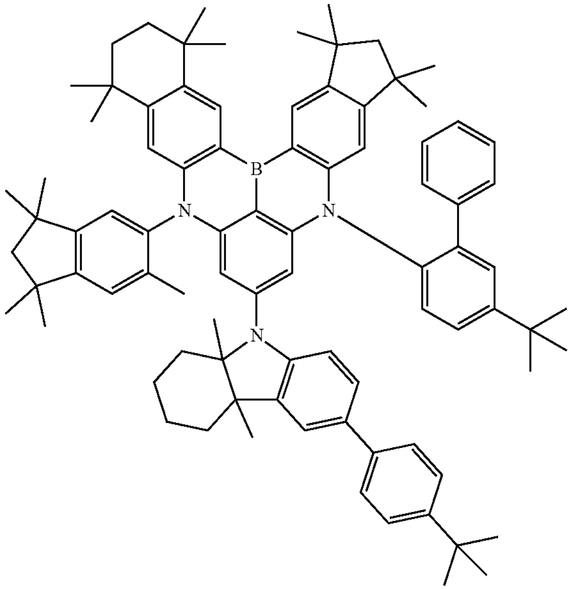

-continued
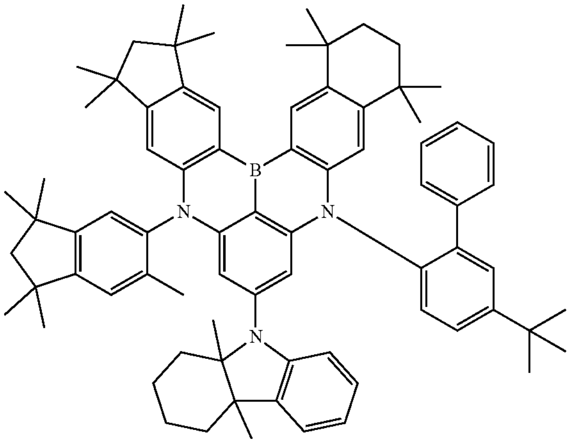
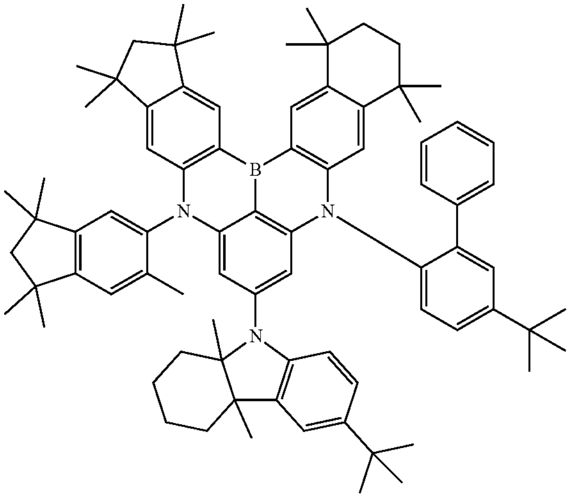
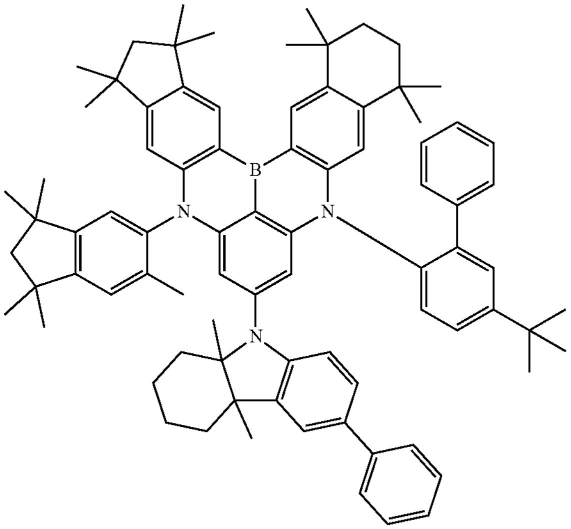
-continued
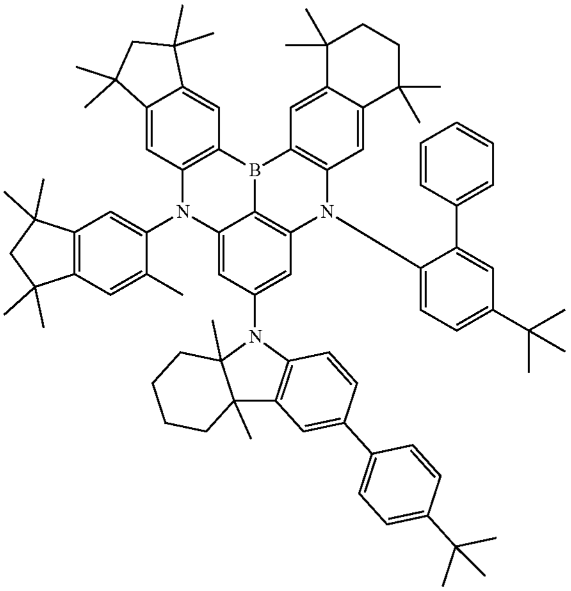
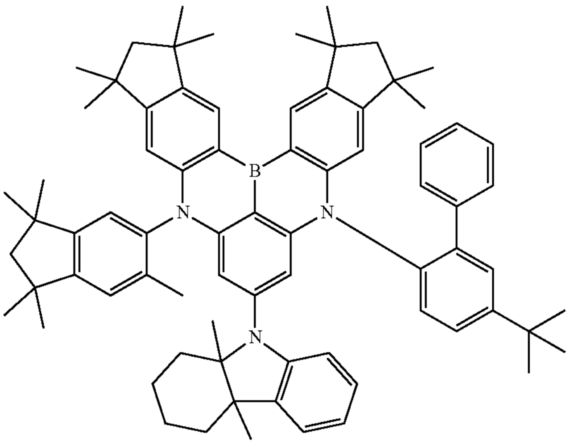
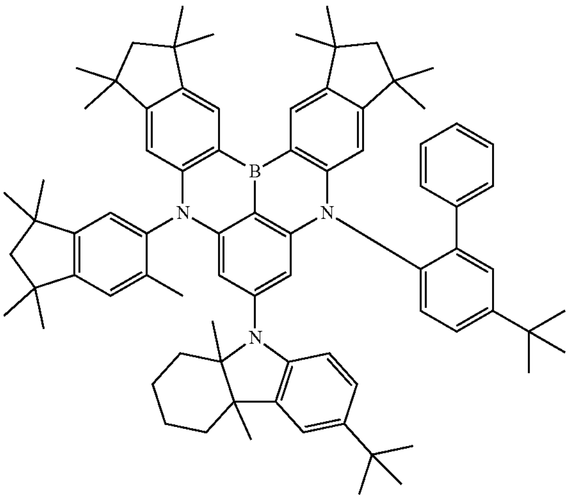

-continued
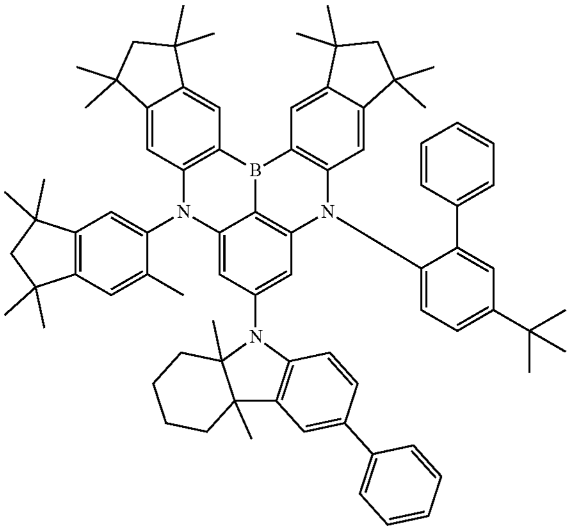
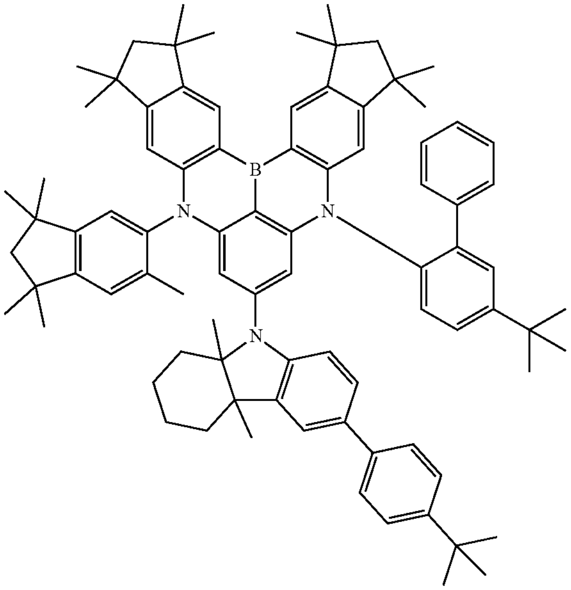
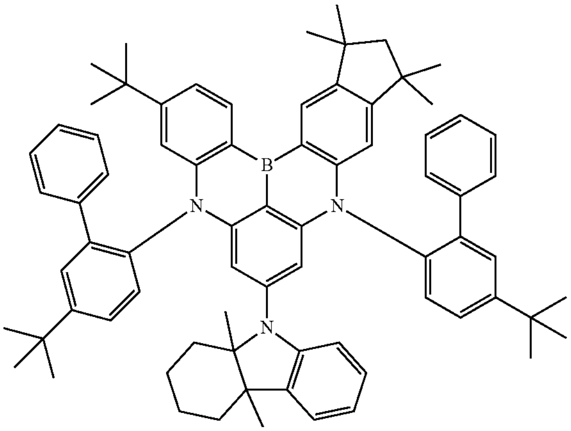
-continued
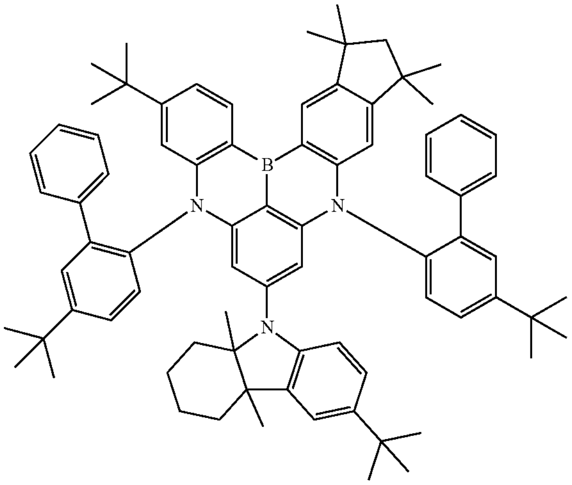
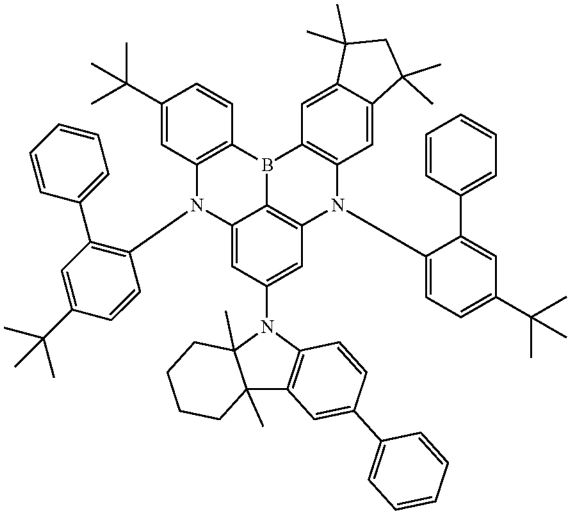
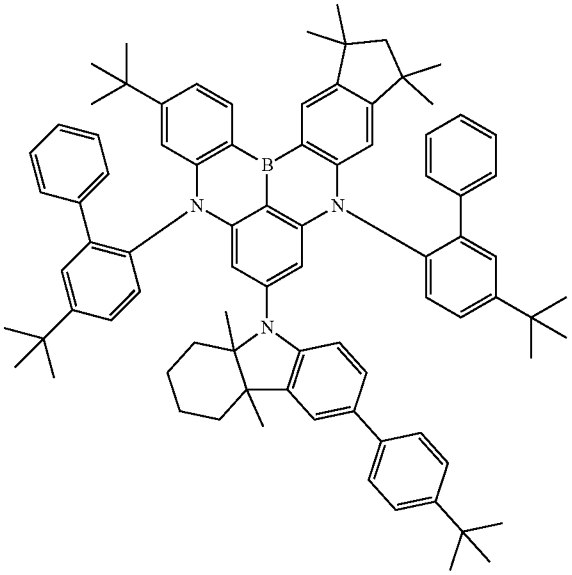

-continued
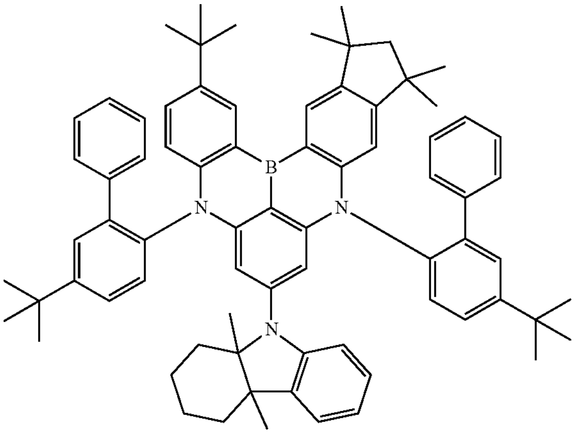
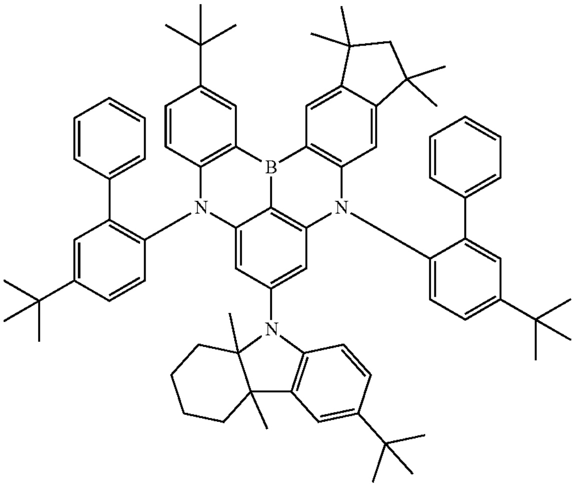
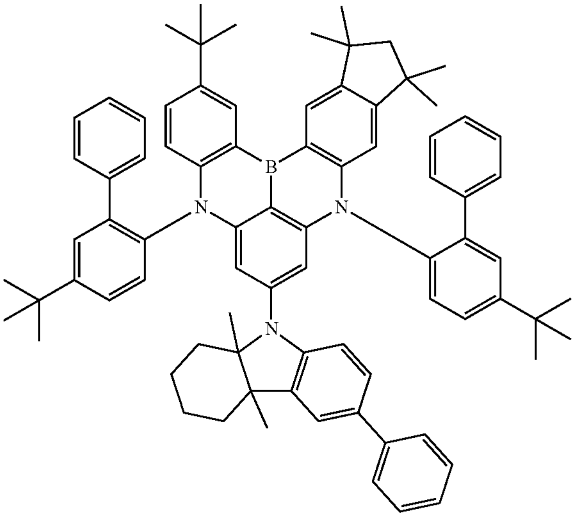
-continued
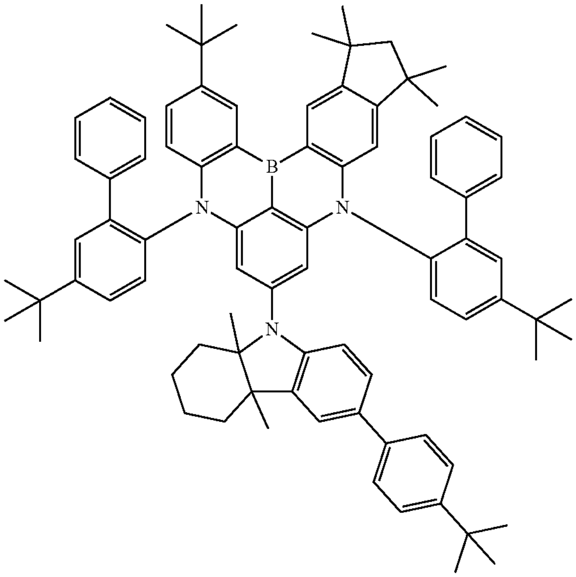
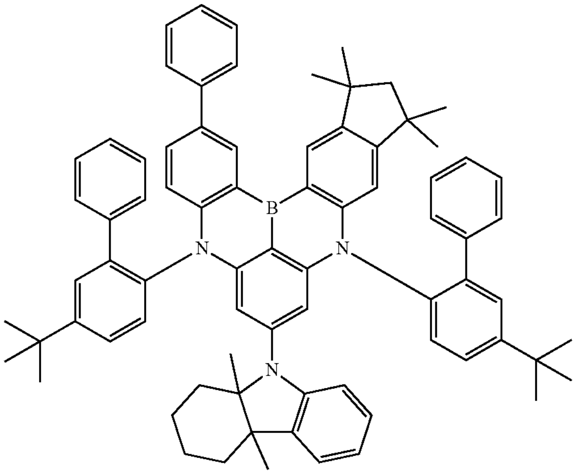
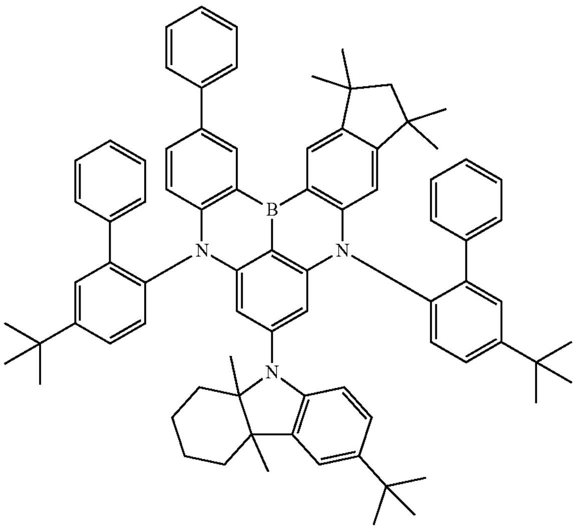

-continued
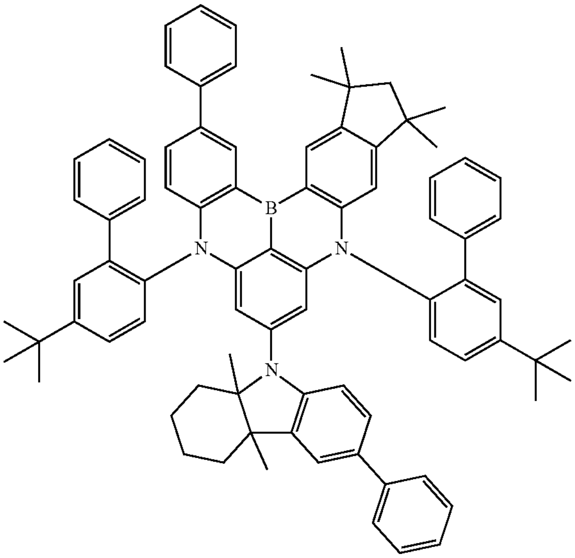
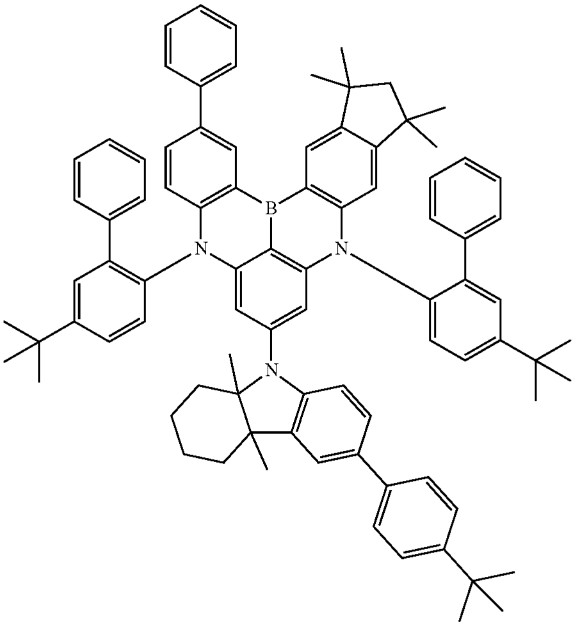
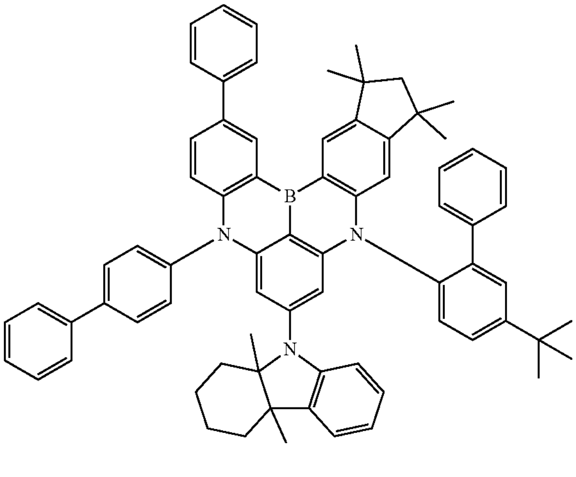
-continued
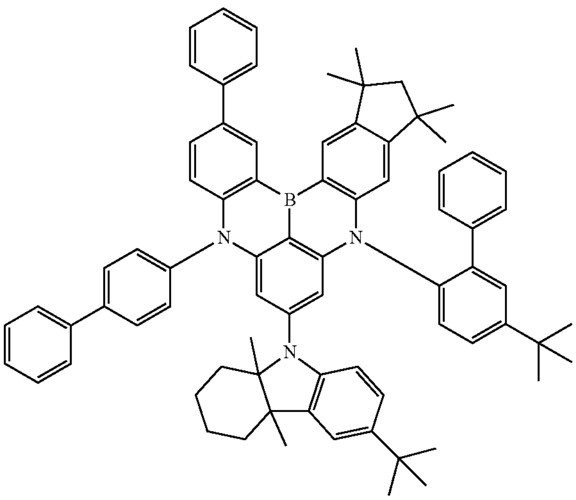
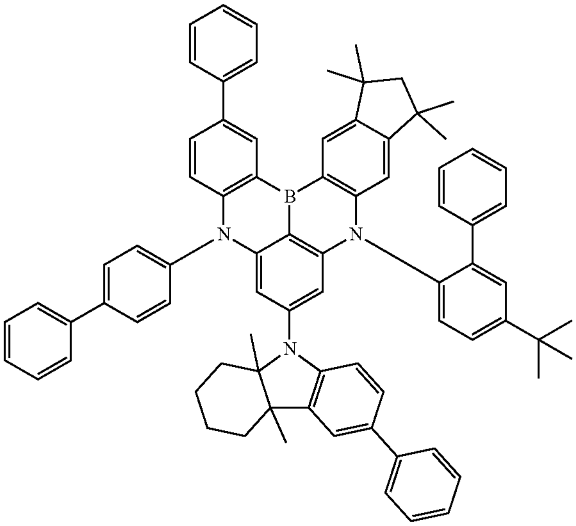
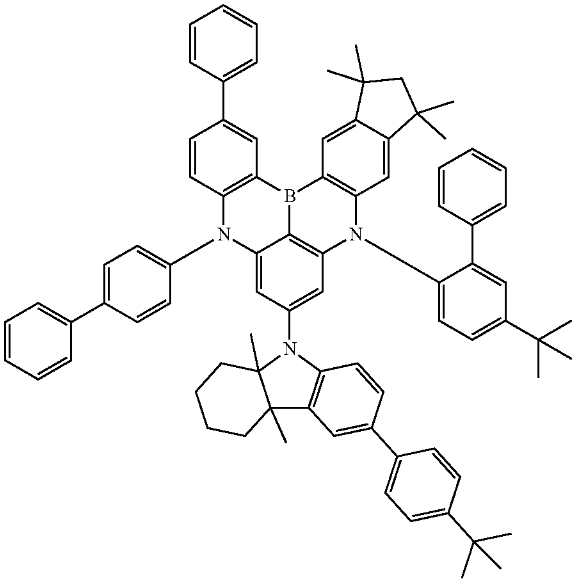

-continued
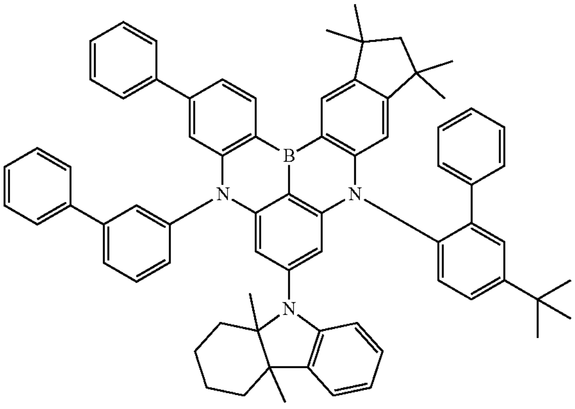
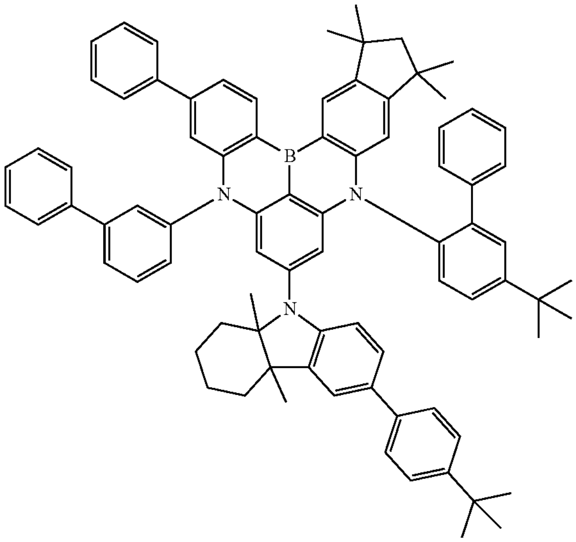
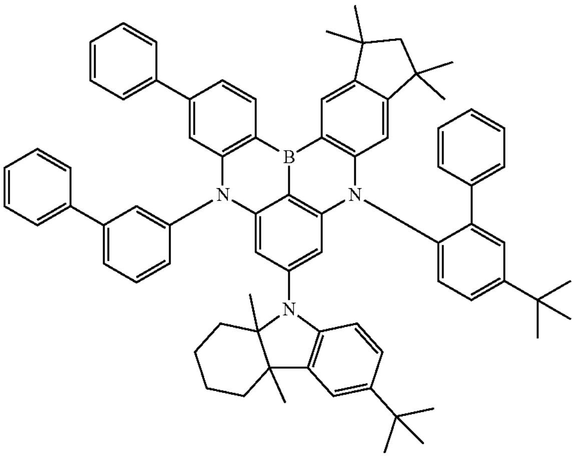
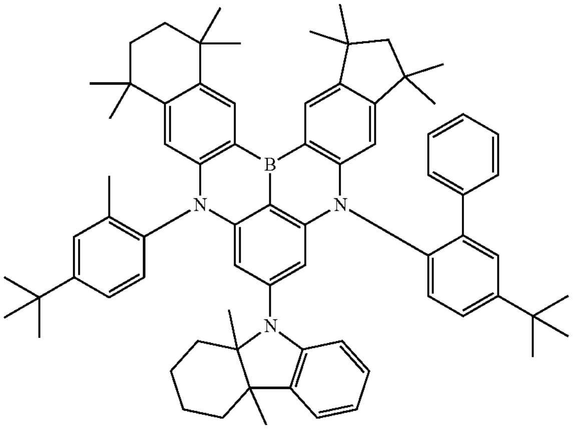
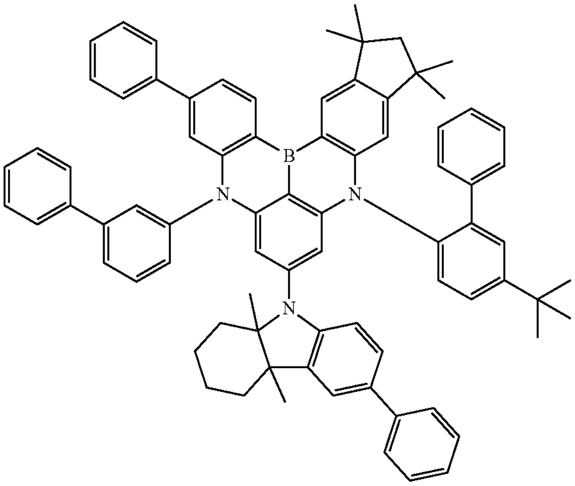
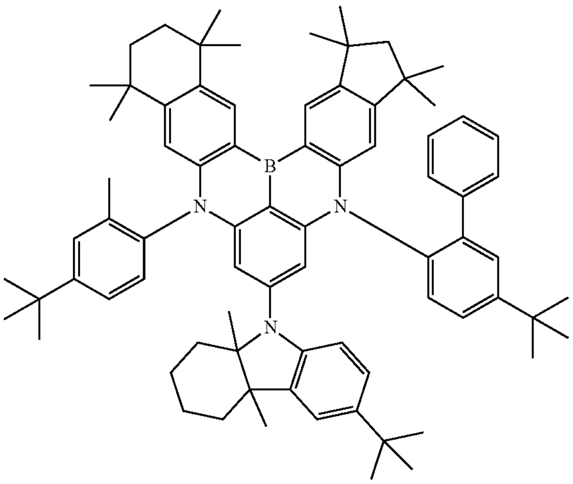

-continued
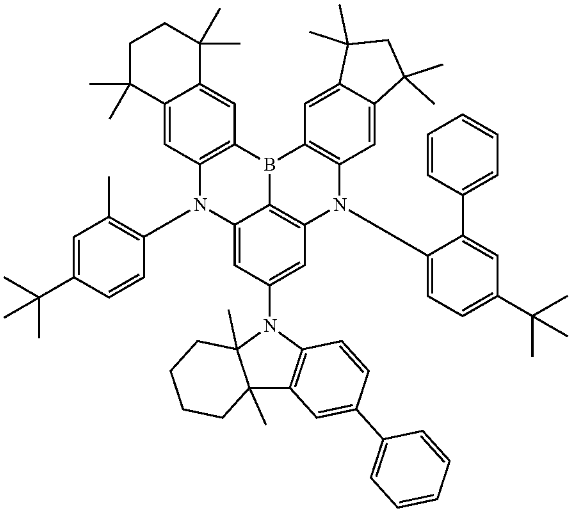
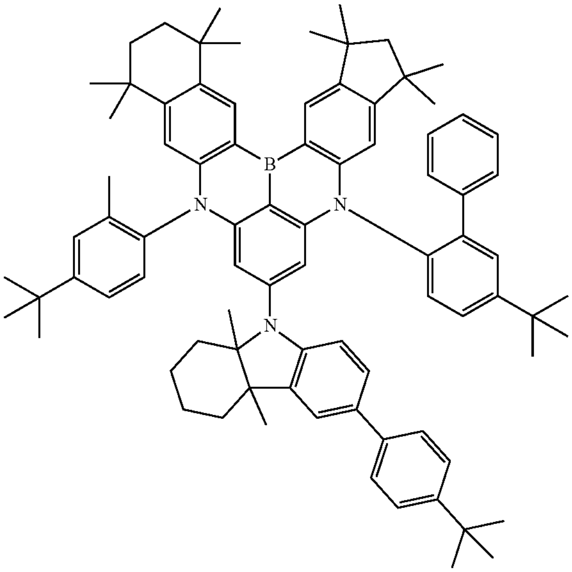
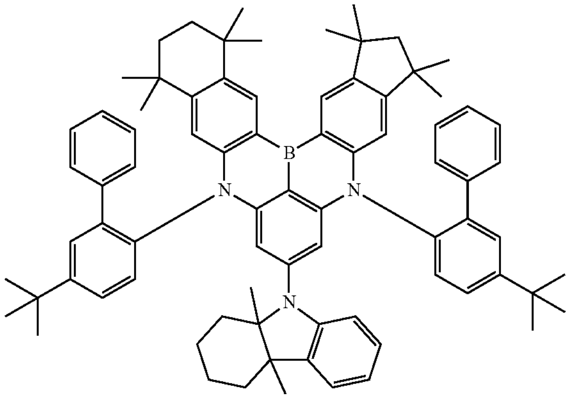
-continued
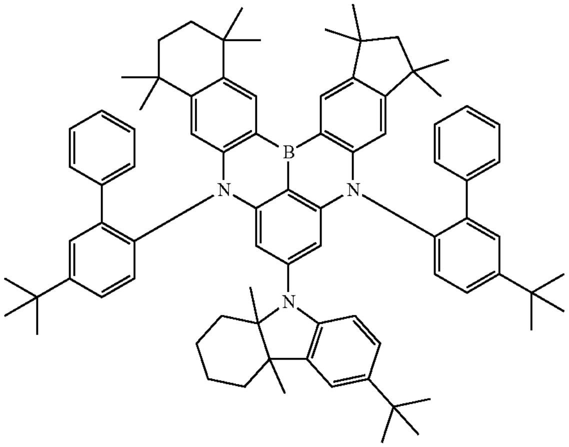
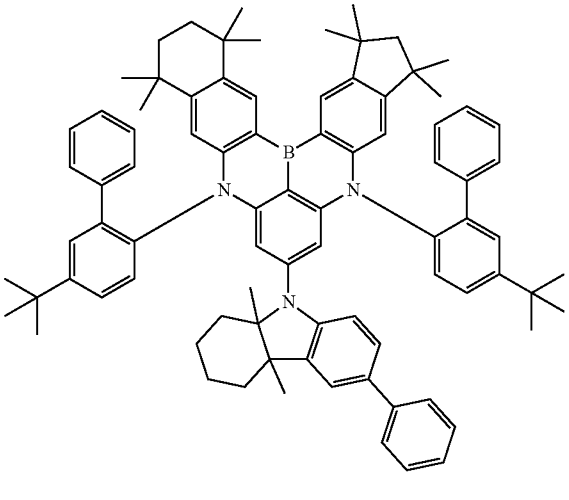
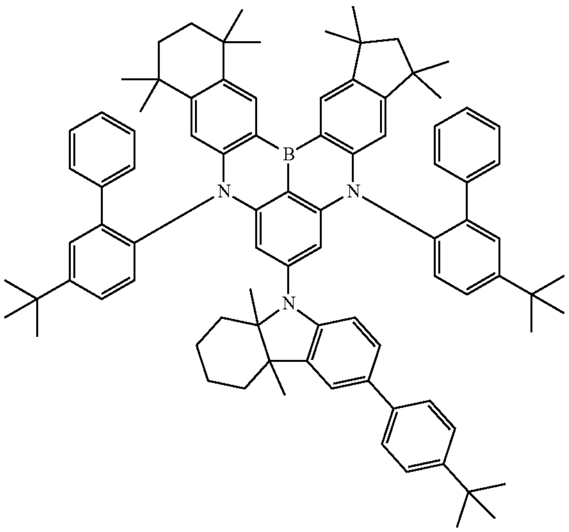

-continued
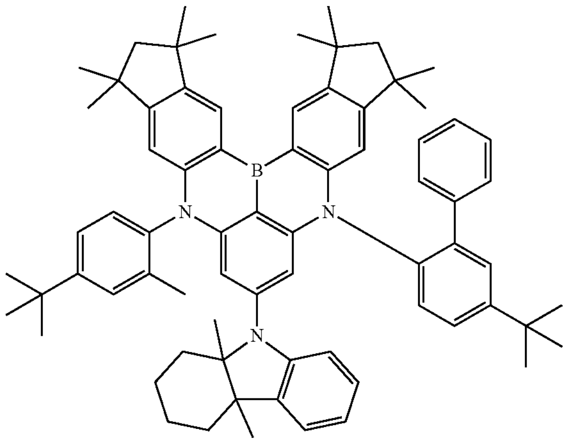
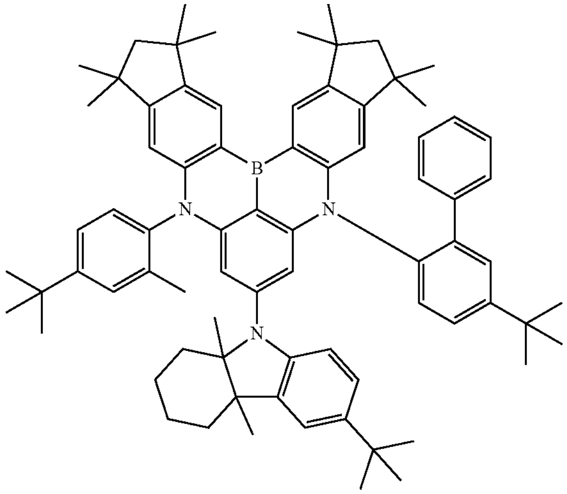
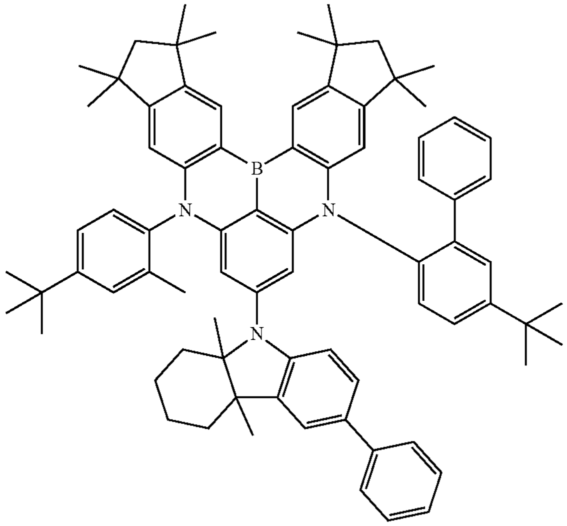
-continued
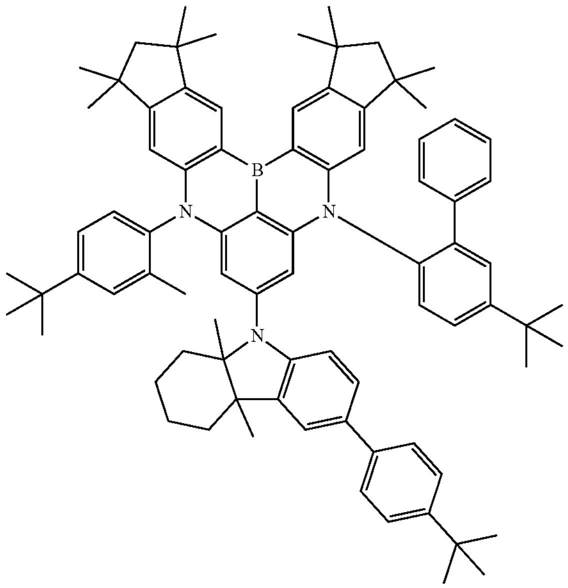
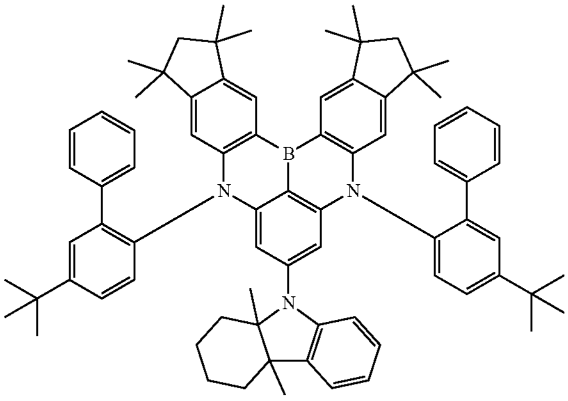
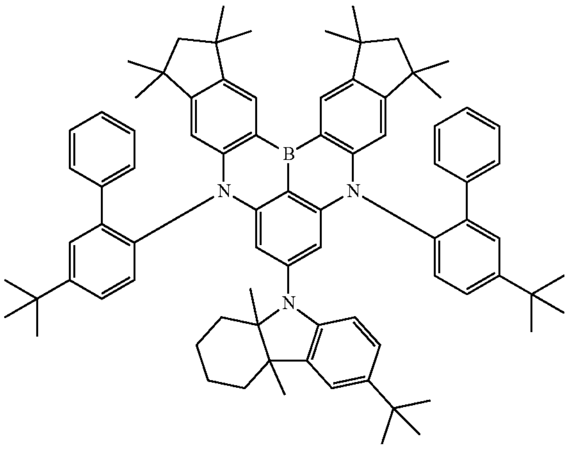

-continued
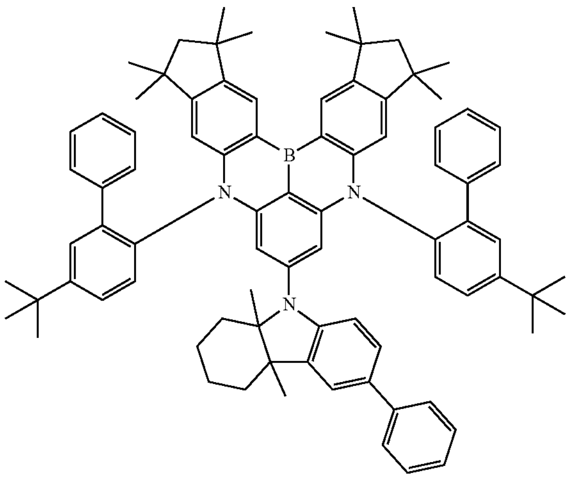
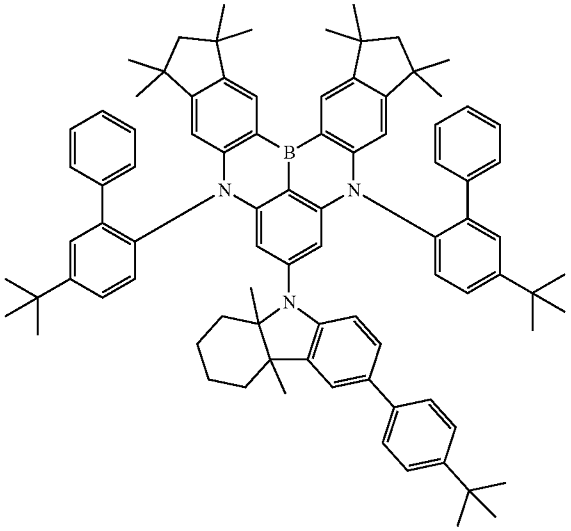
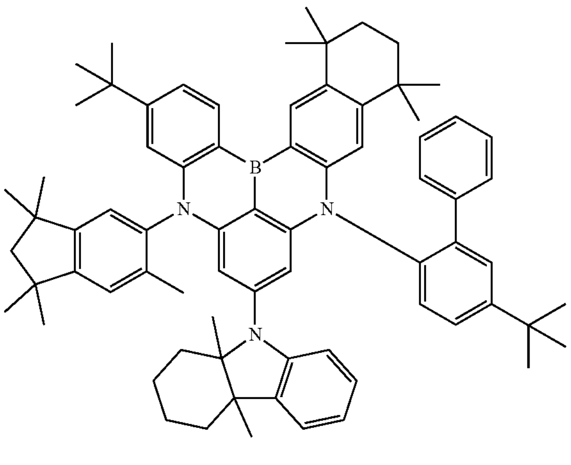
-continued
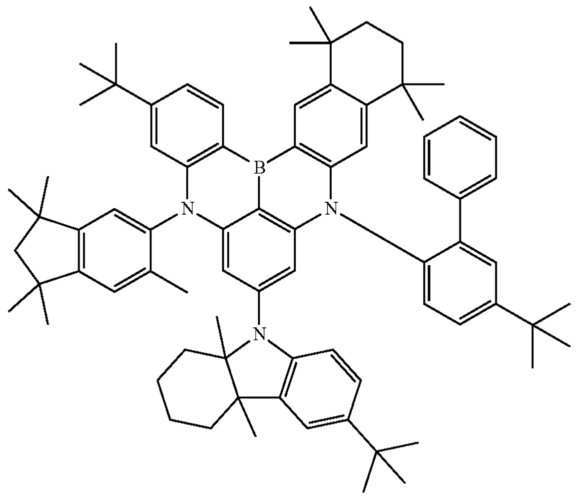
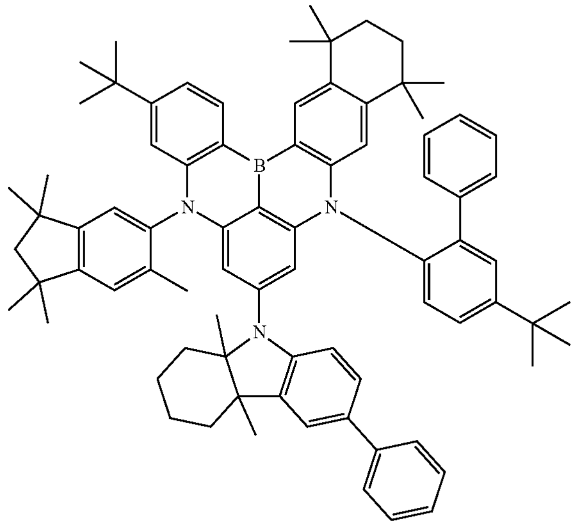
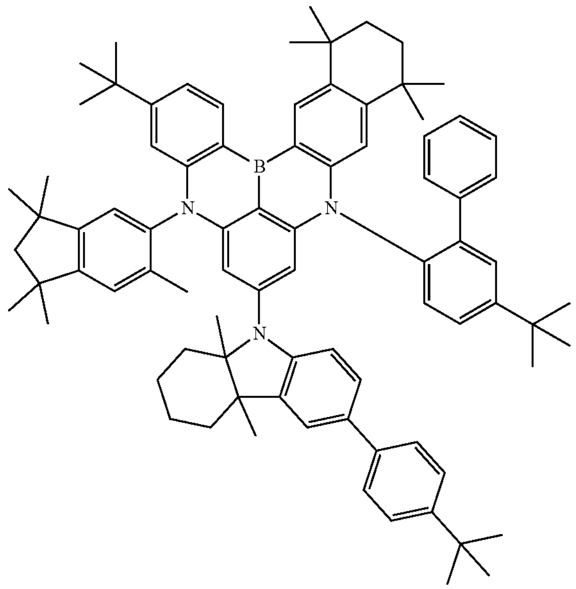

-continued
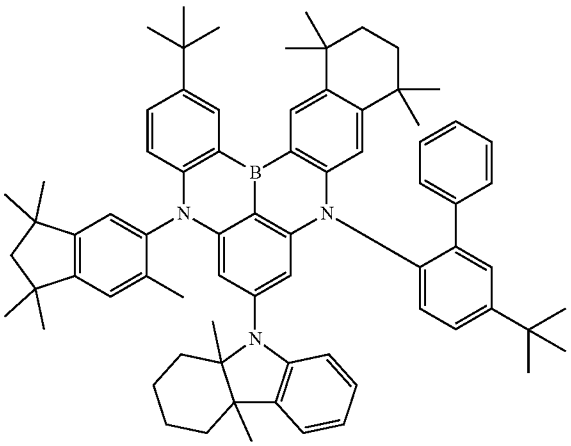
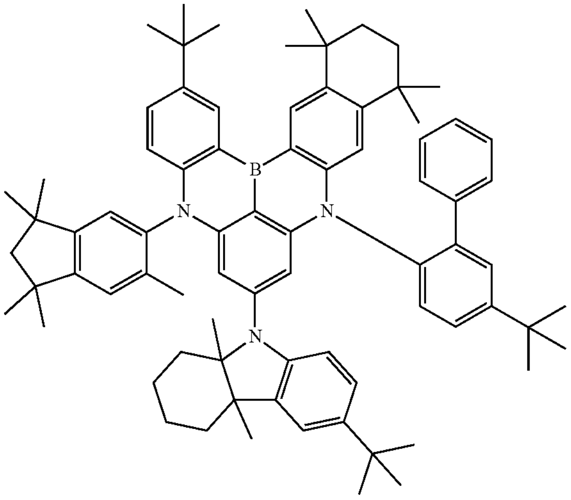
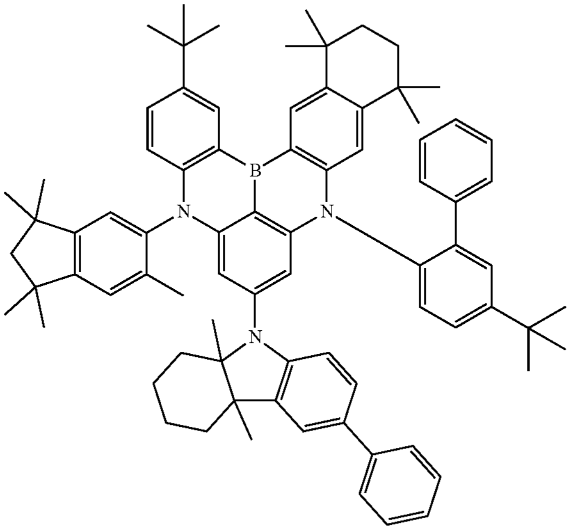
-continued
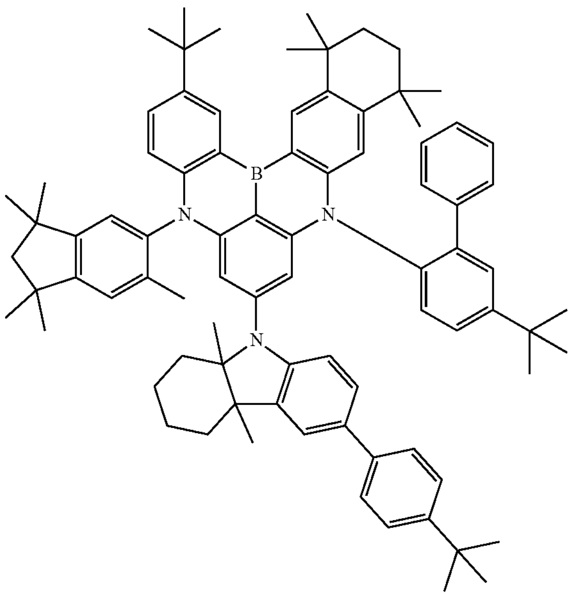
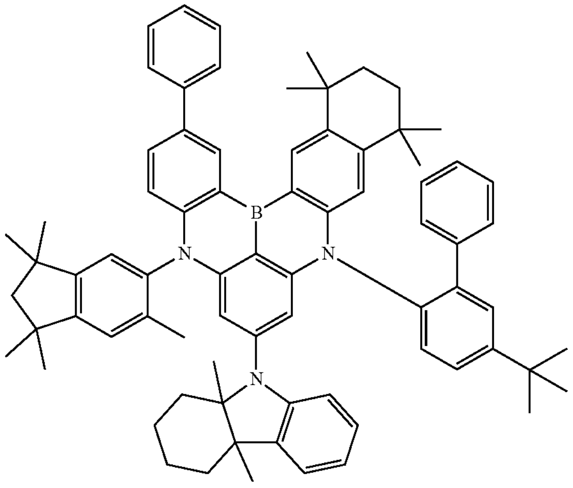
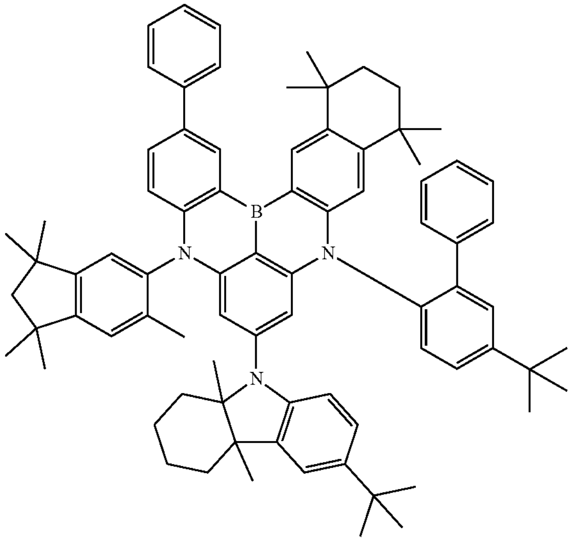

-continued
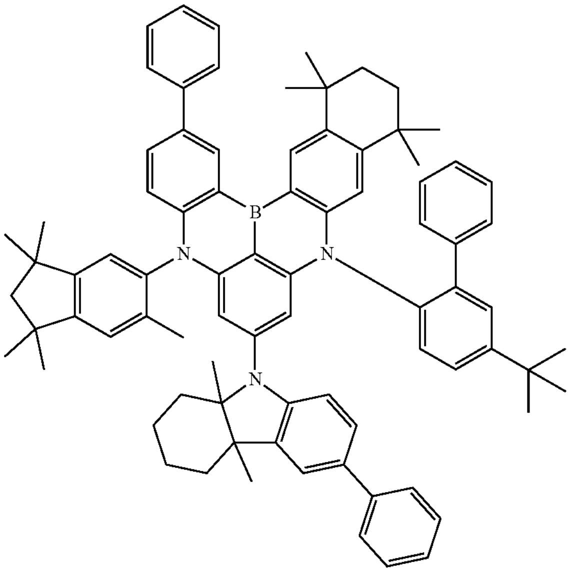
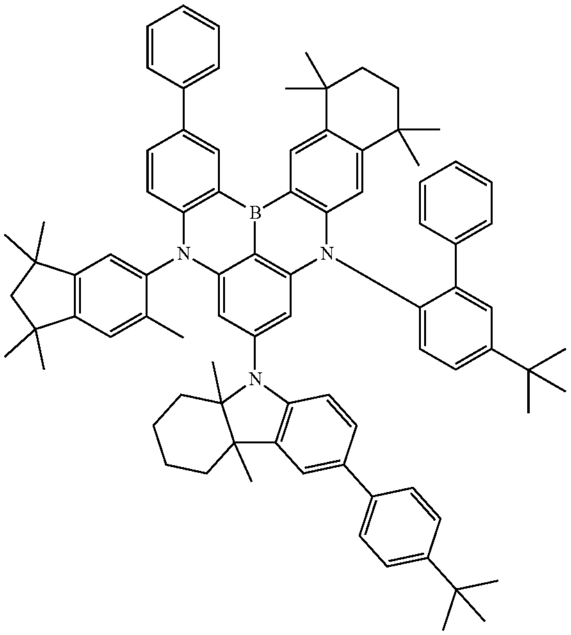
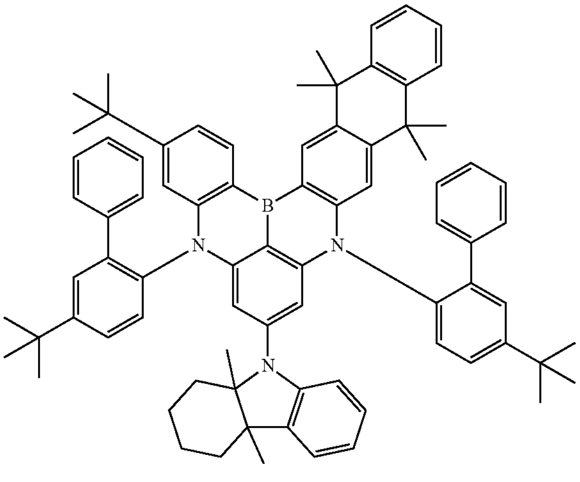
-continued
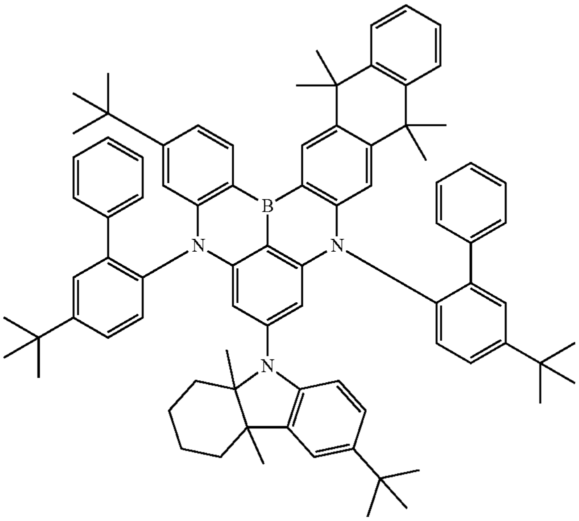
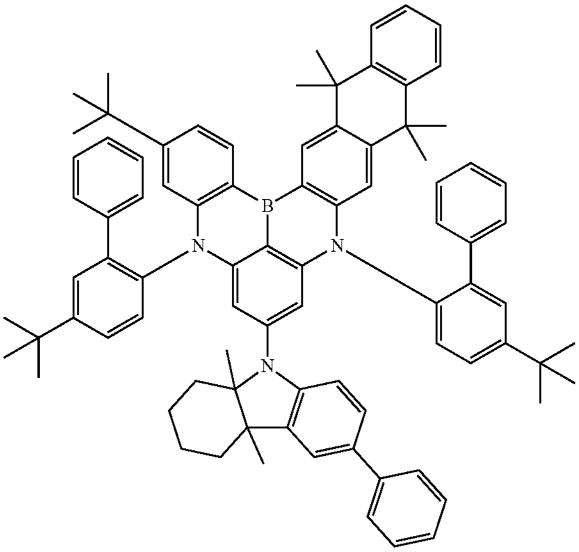
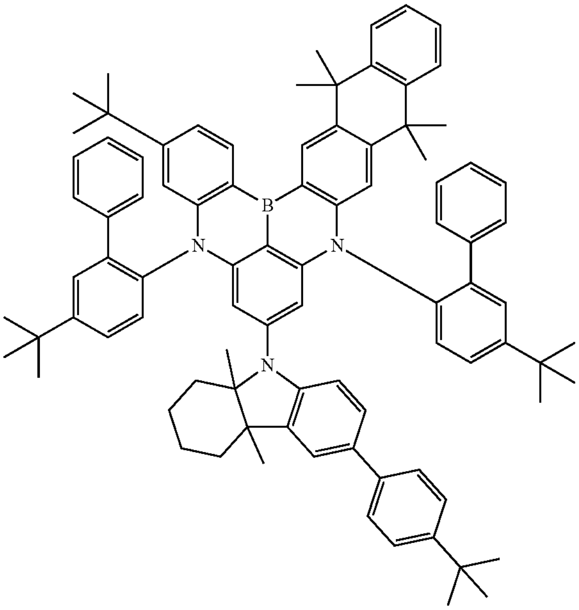

-continued
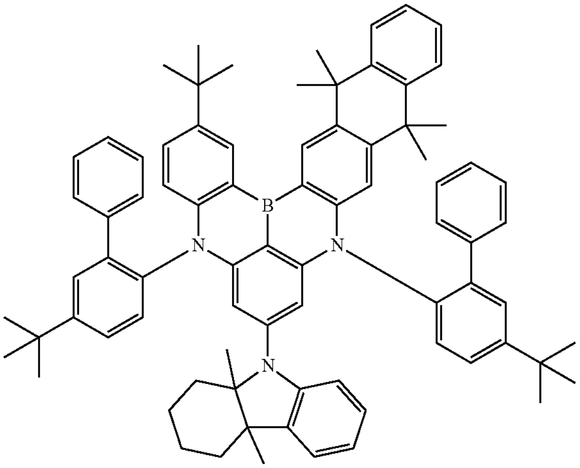
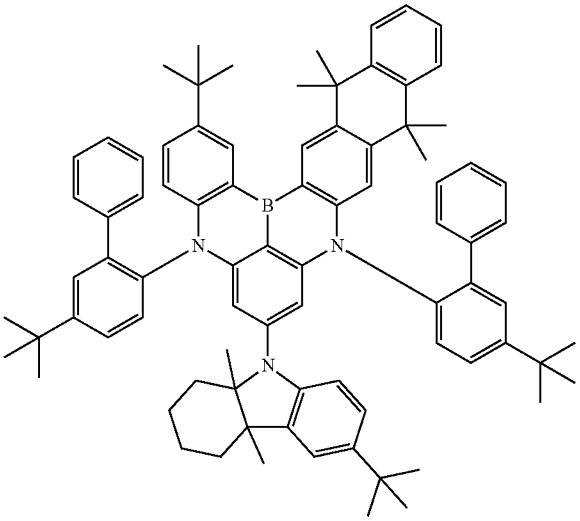
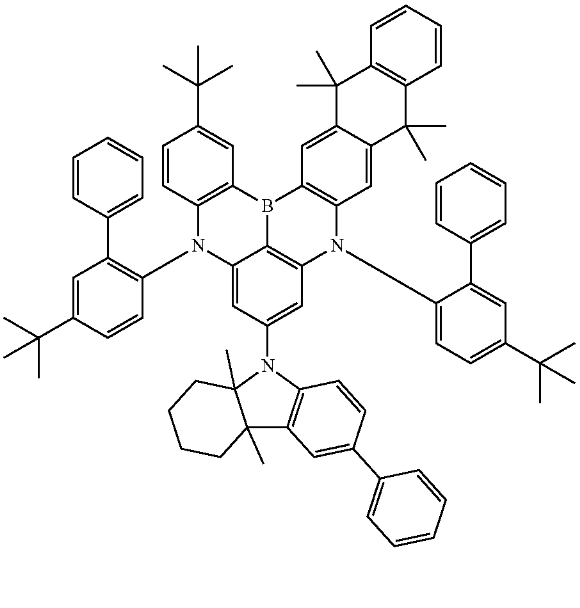
-continued
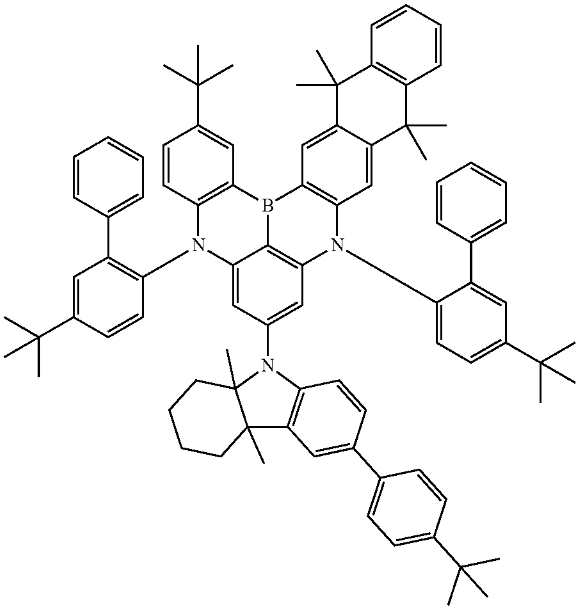
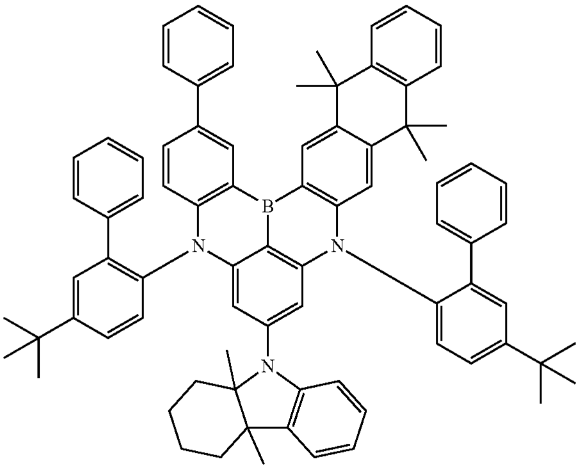
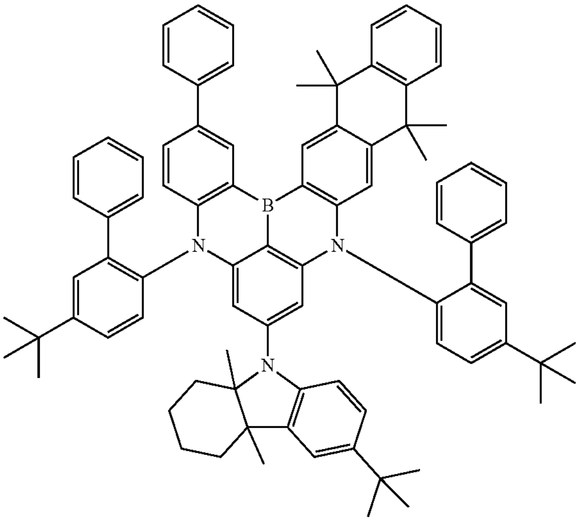

-continued
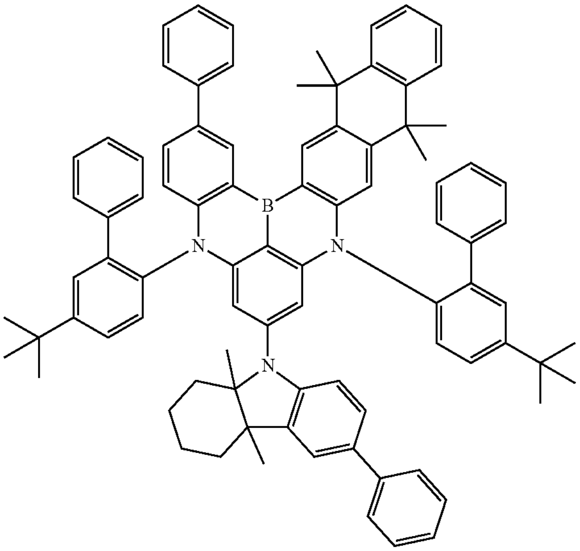
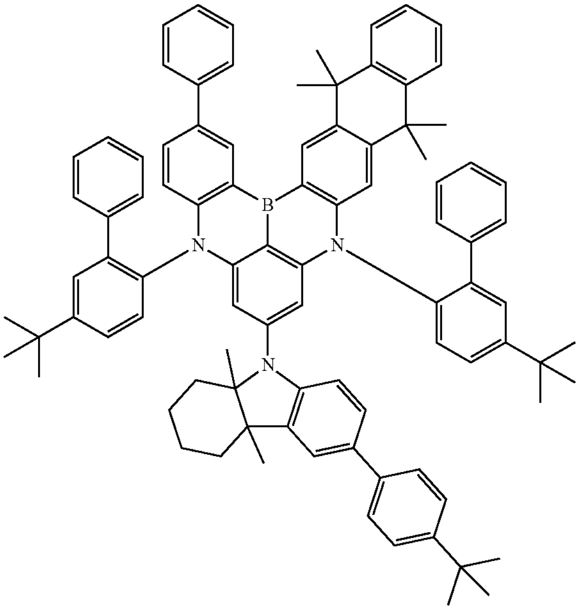
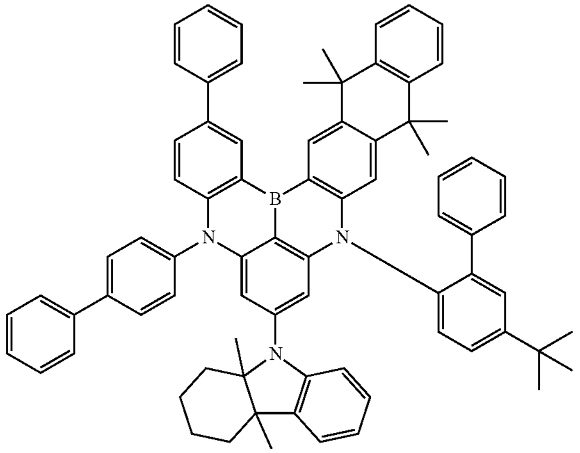 [SMILES: CC(C)(C)c1ccc(N2c3cc4c(cc3B3c5cc(-c6ccccc6)ccc5N(c5ccc(-c6ccccc6)cc5)c5cc(N6c7ccccc7C7(C)CCCCC67C)cc2c53)C(C)(C)c2ccccc2C4(C)C)c(-c2ccccc2)c1]
-continued
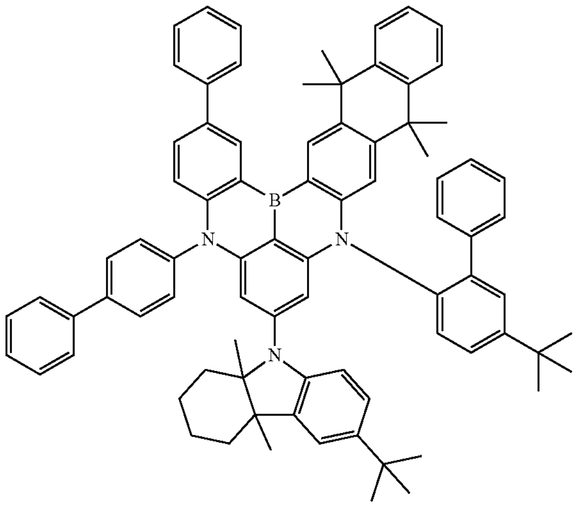
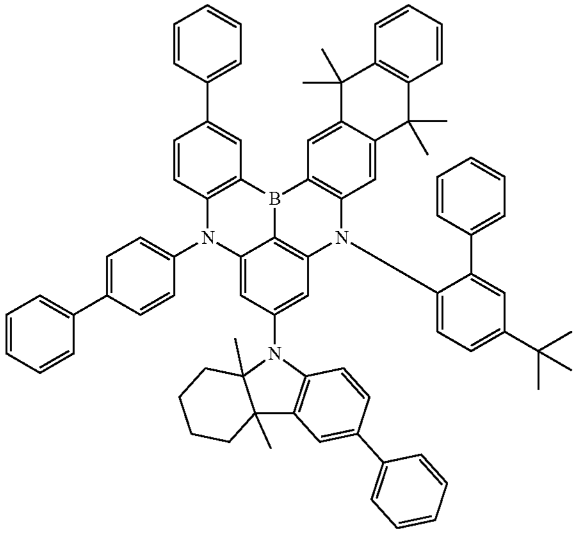
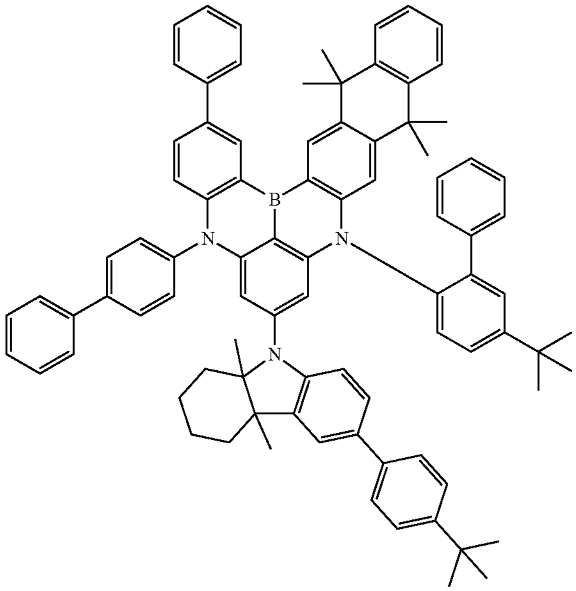

-continued
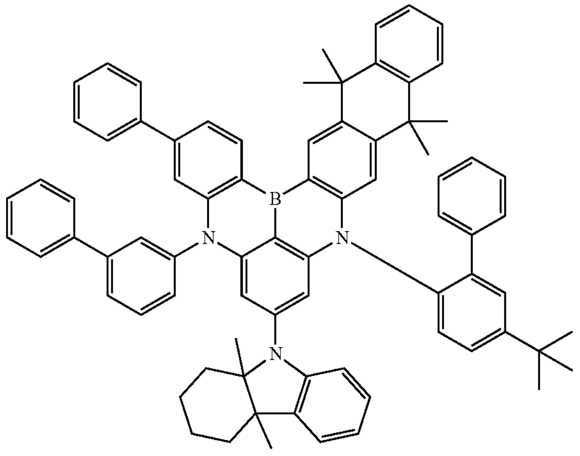
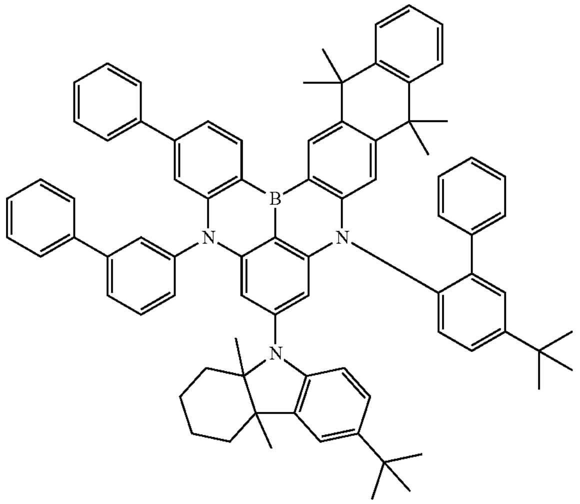
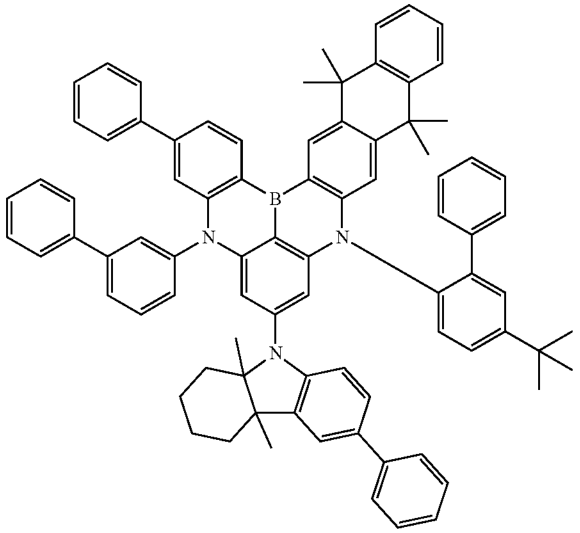
-continued
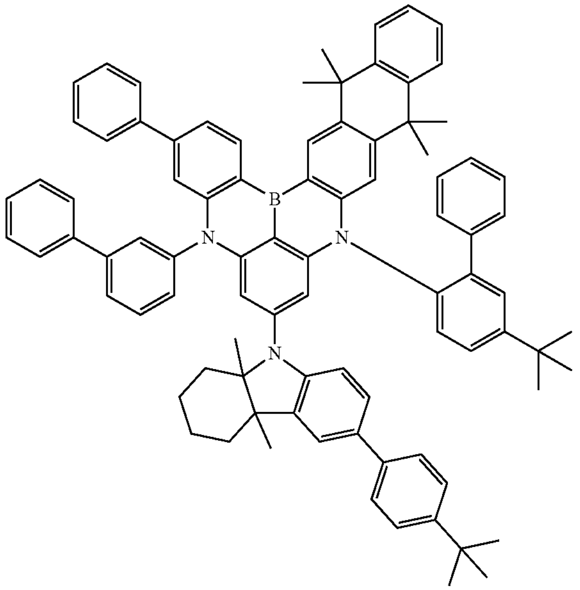
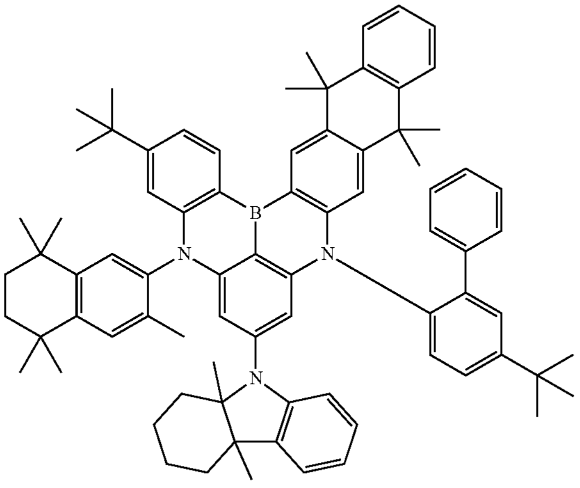
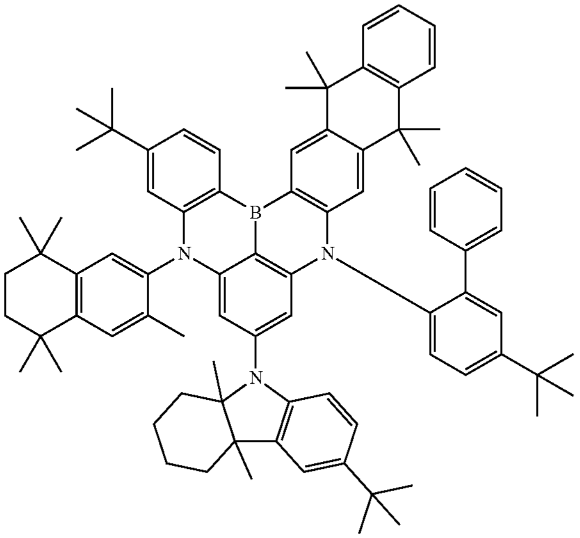

-continued
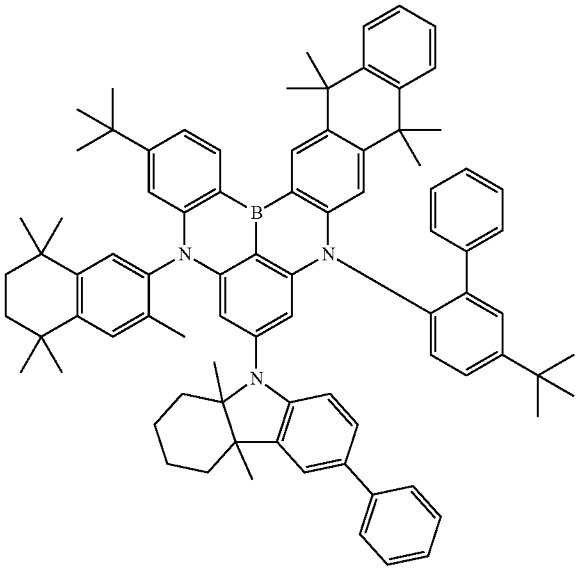
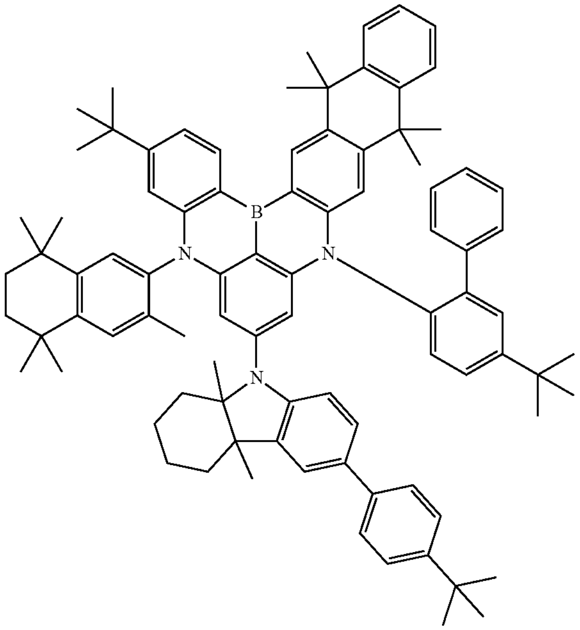
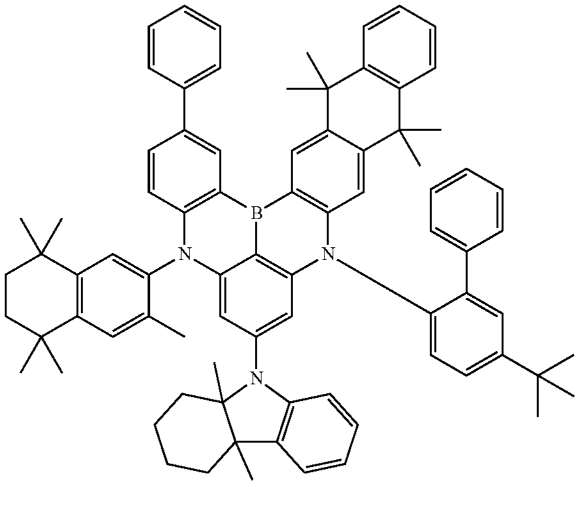
-continued
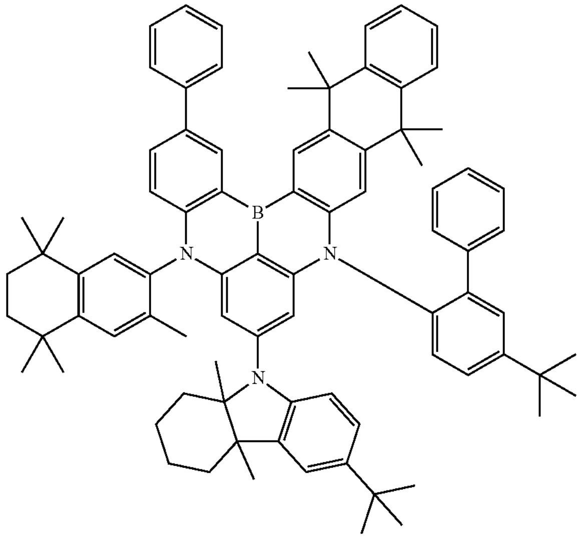
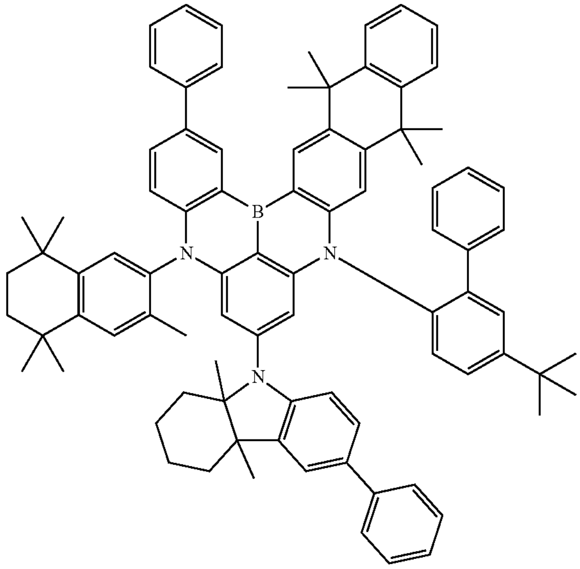

-continued
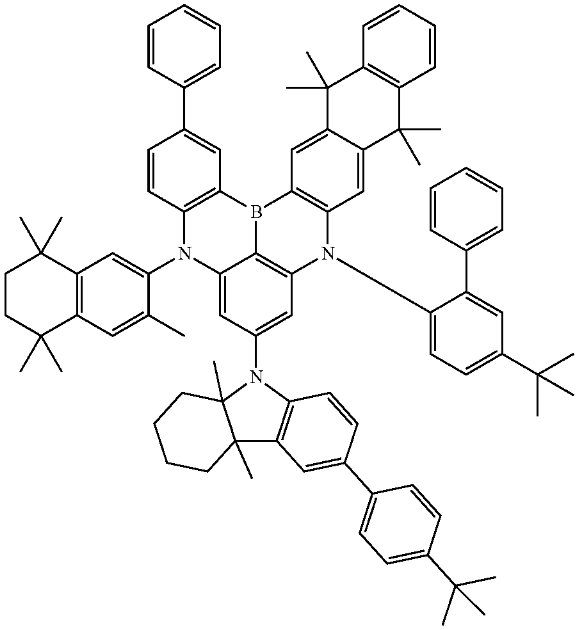
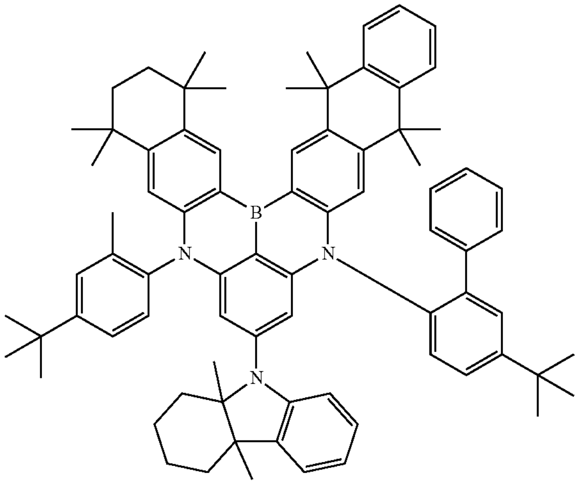
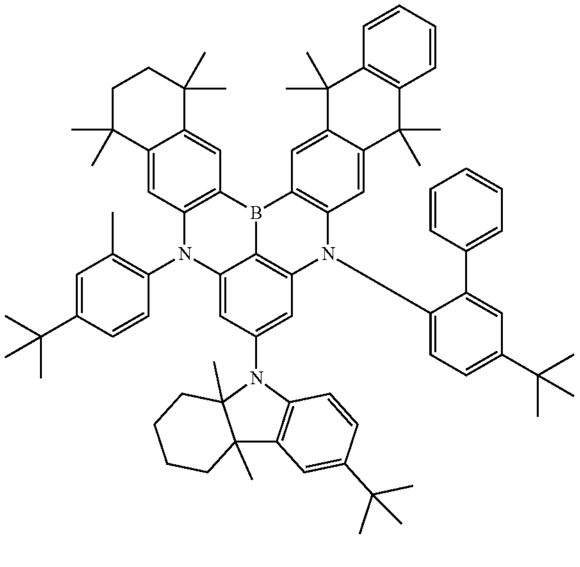
-continued
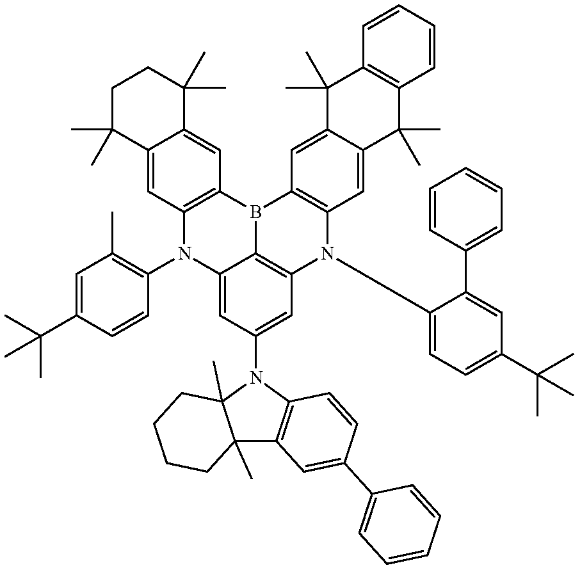
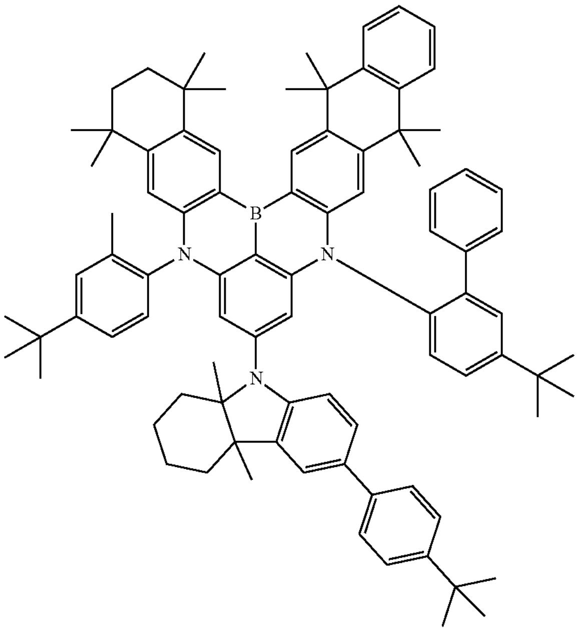
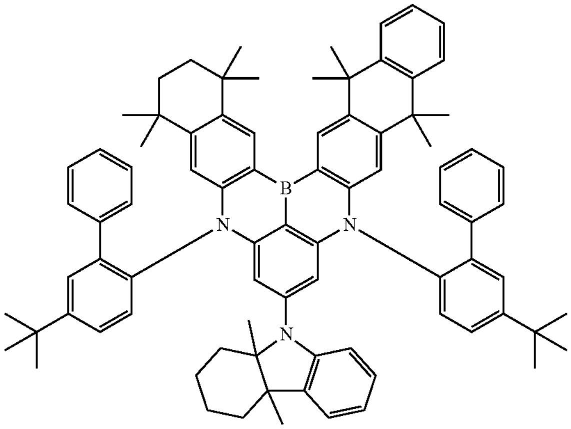

-continued
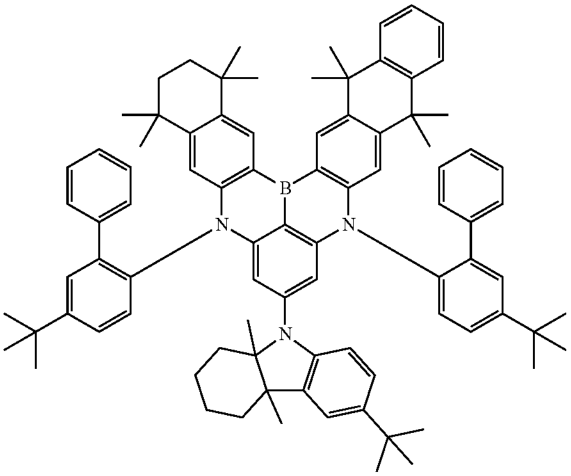
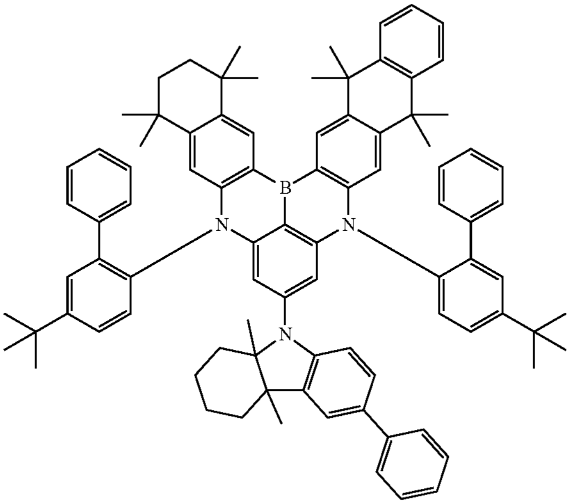
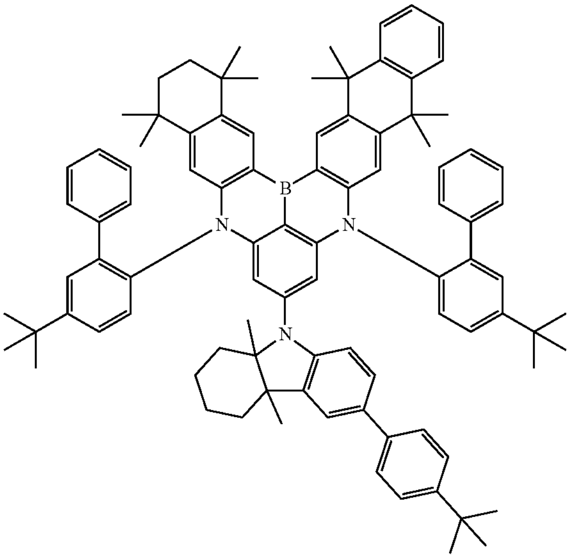
-continued
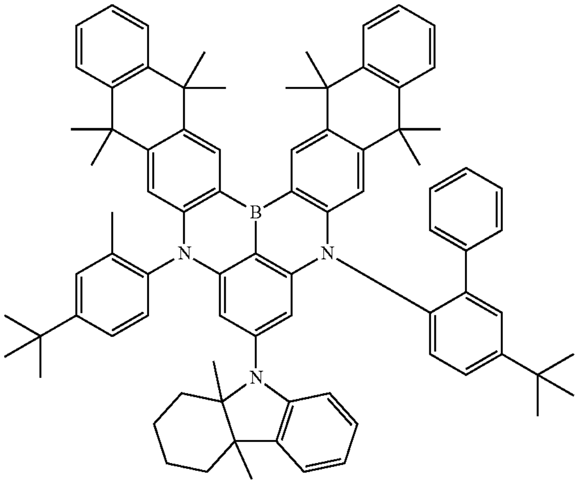
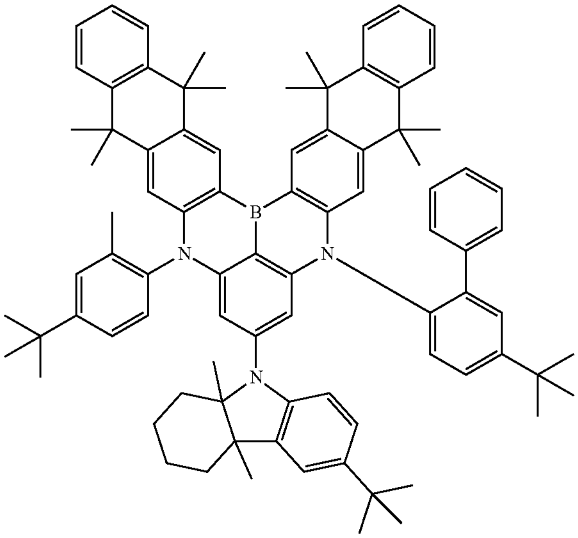
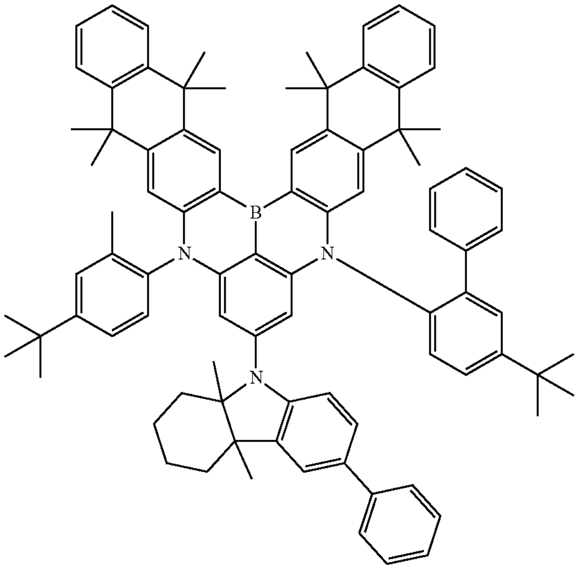

-continued
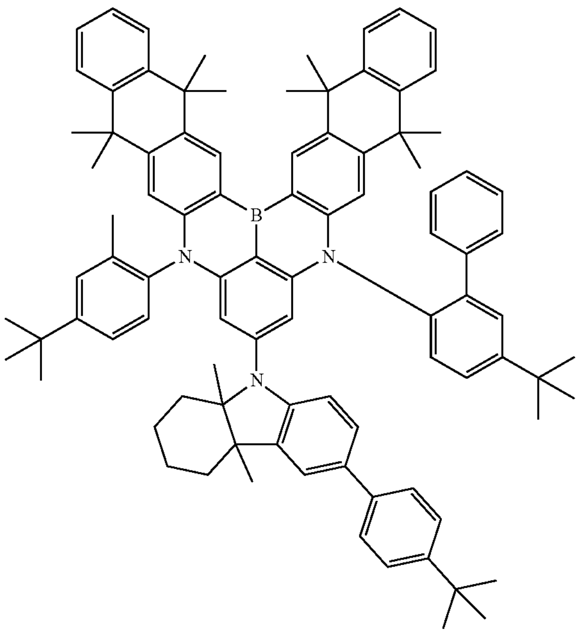
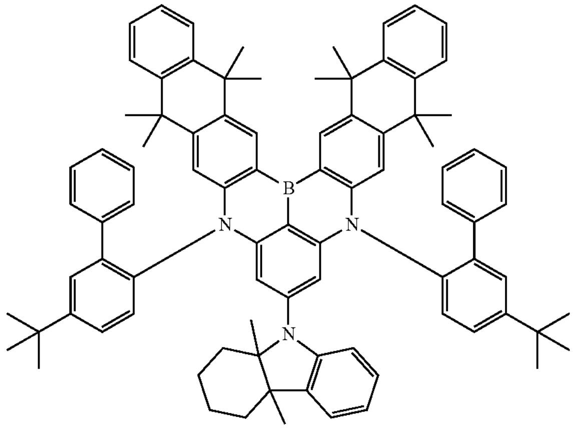
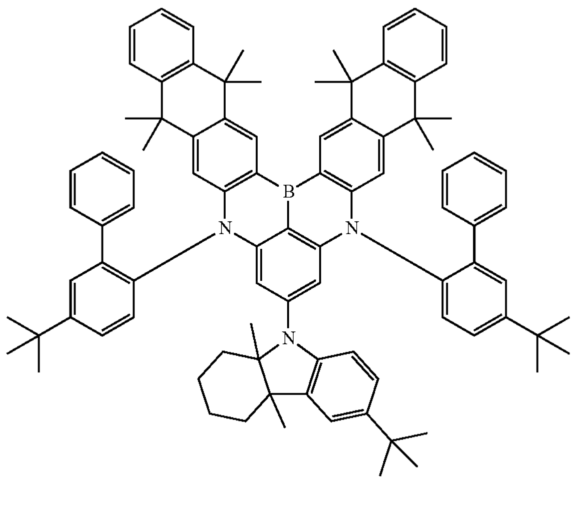
-continued
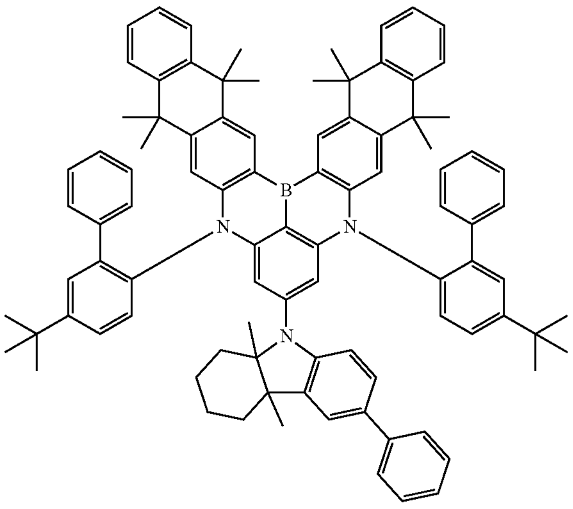
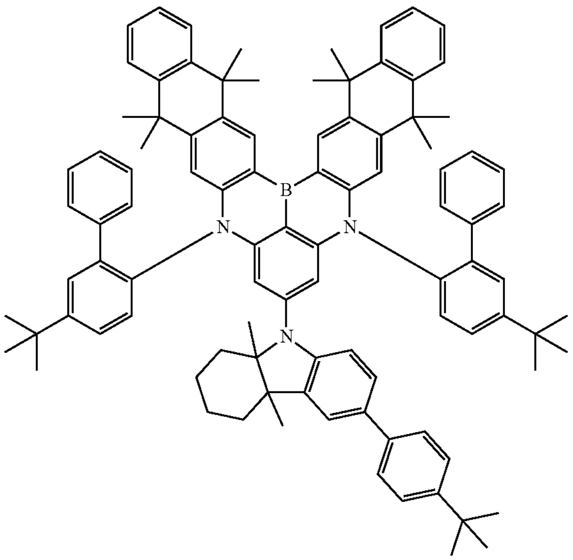
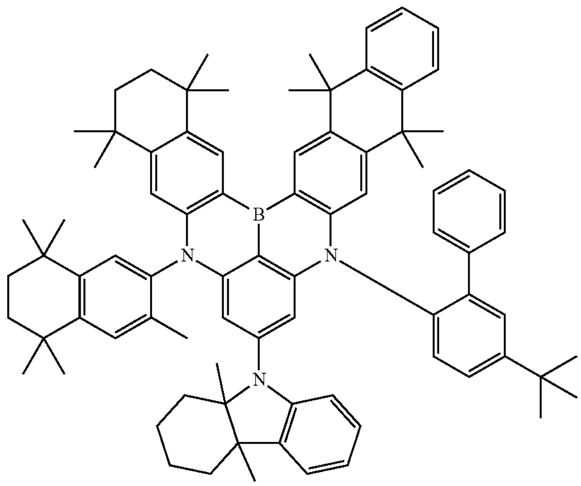

-continued
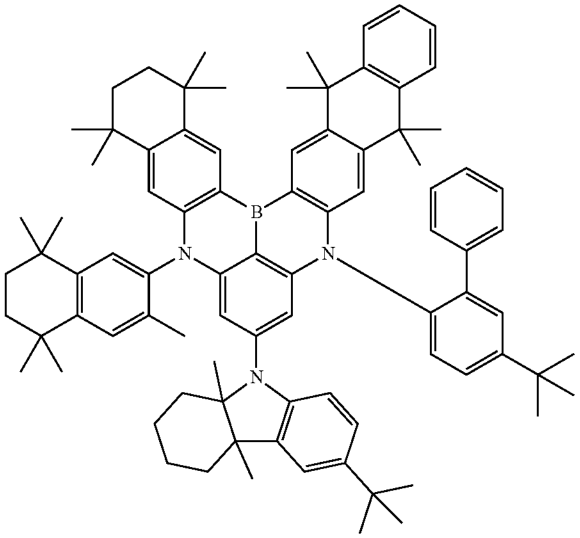
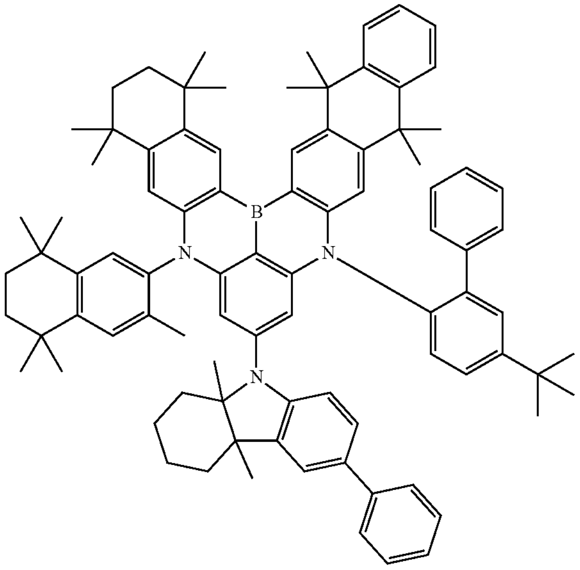
-continued
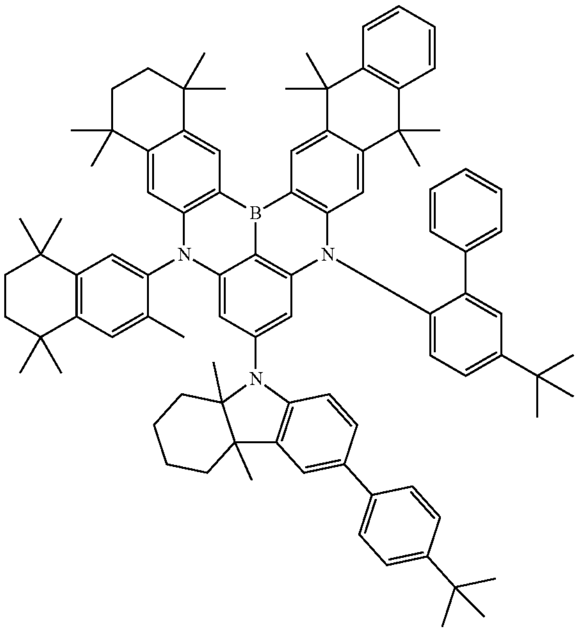
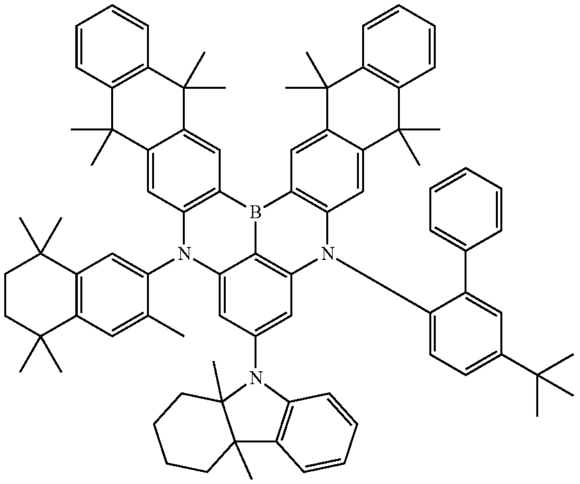
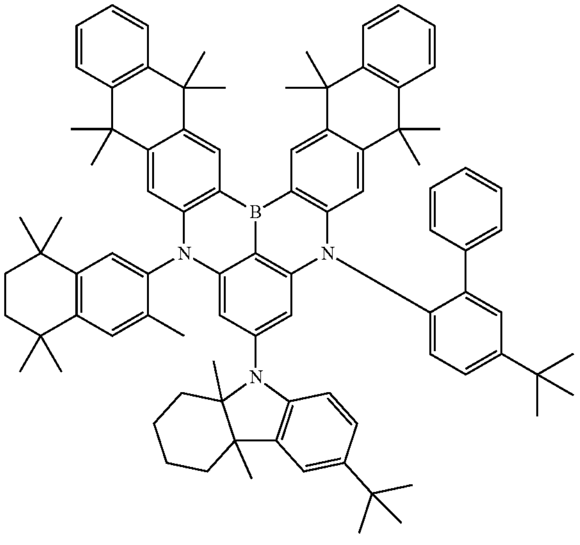

-continued
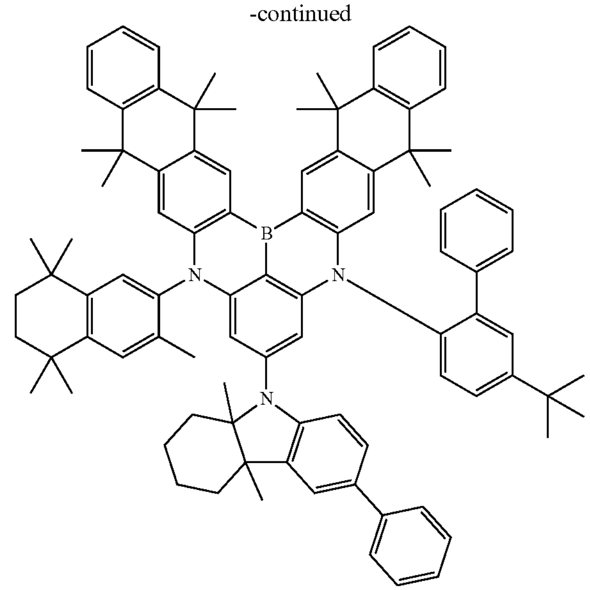
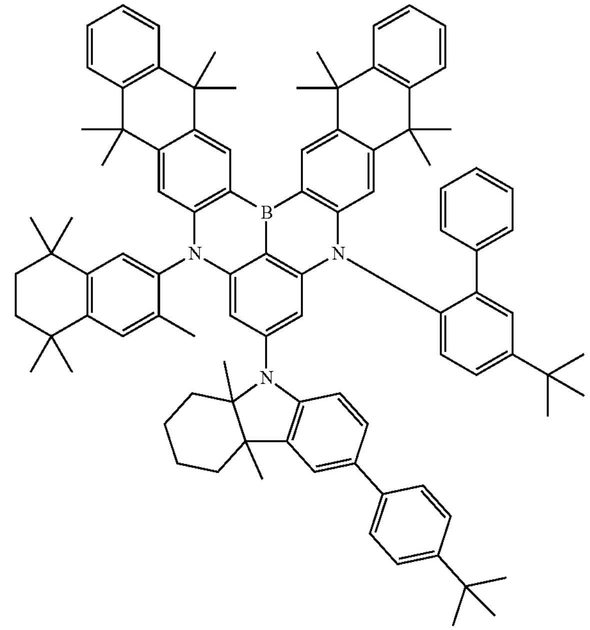
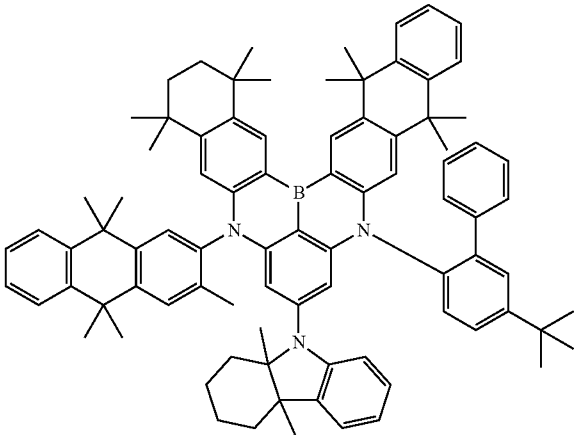
-continued
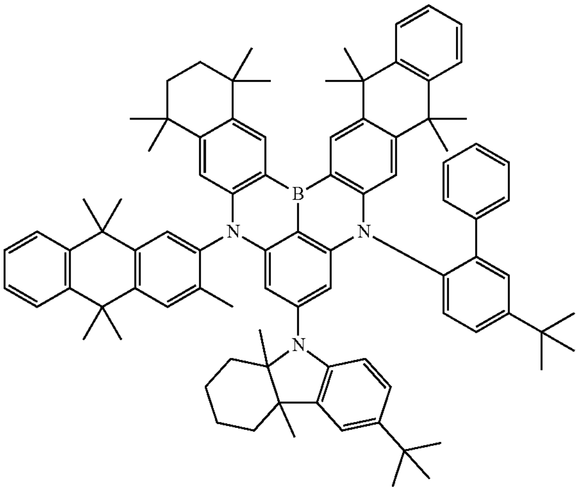
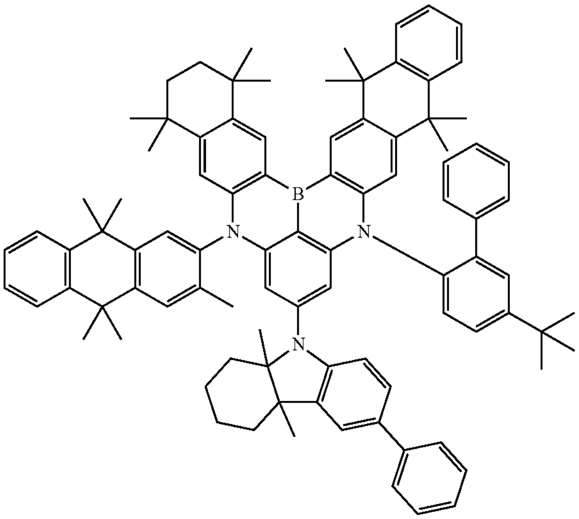
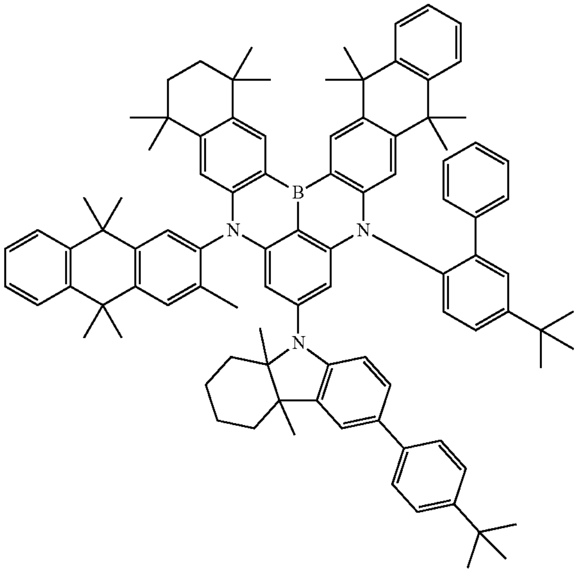 [SMILES: Cc1cc2c(cc1N1c3cc4c(cc3B3c5cc6c(cc5N(c5ccc(C(C)(C)C)cc5-c5ccccc5)c5cc(N7c8ccc(-c9ccc(C(C)(C)C)cc9)cc8C8(C)CCCCC78C)cc1c53)C(C)(C)c1ccccc1C6(C)C)C(C)(C)CCC4(C)C)C(C)(C)c1ccccc1C2(C)C]

-continued
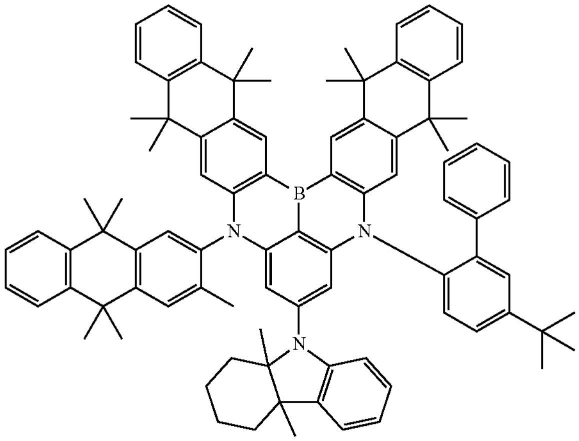
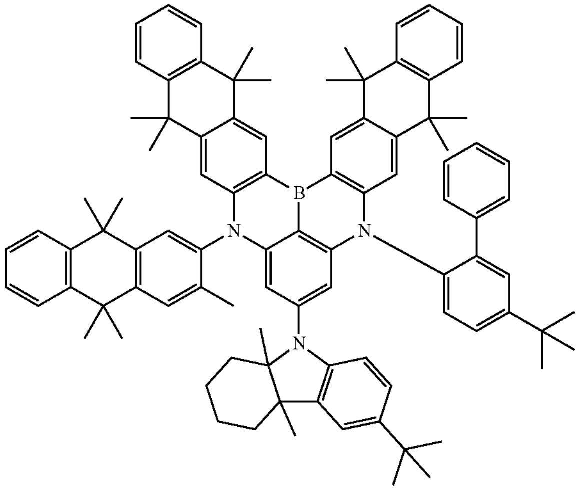
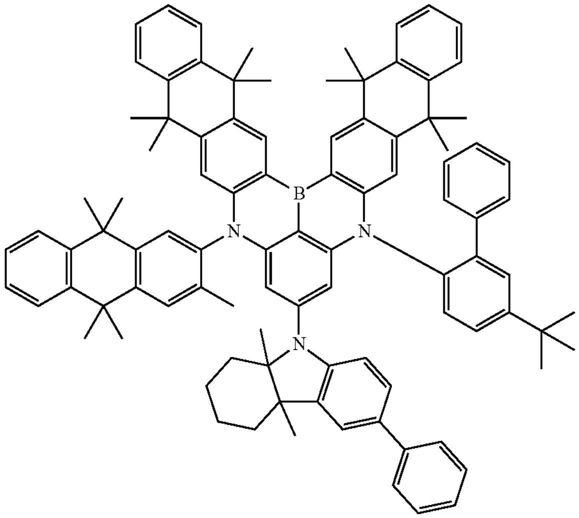
-continued
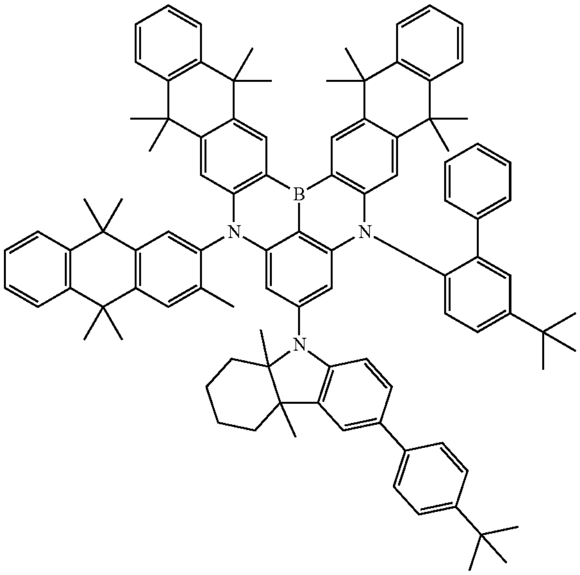 [SMILES: Cc1cc2c(cc1N1c3cc4c(cc3B3c5cc6c(cc5N(c5ccc(C(C)(C)C)cc5-c5ccccc5)c5cc(N7c8ccc(-c9ccc(C(C)(C)C)cc9)cc8C8(C)CCCCC78C)cc1c53)C(C)(C)c1ccccc1C6(C)C)C(C)(C)c1ccccc1C4(C)C)C(C)(C)c1ccccc1C2(C)C]
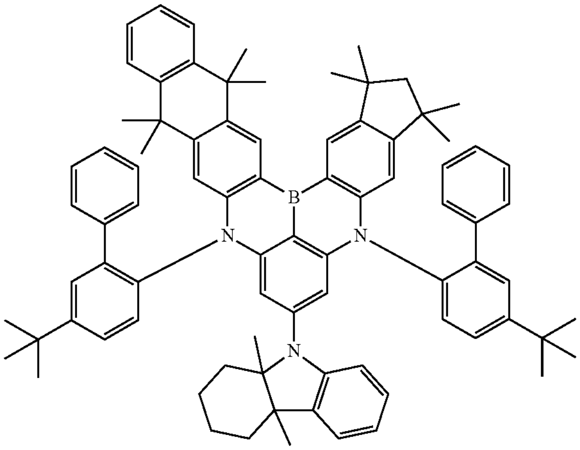
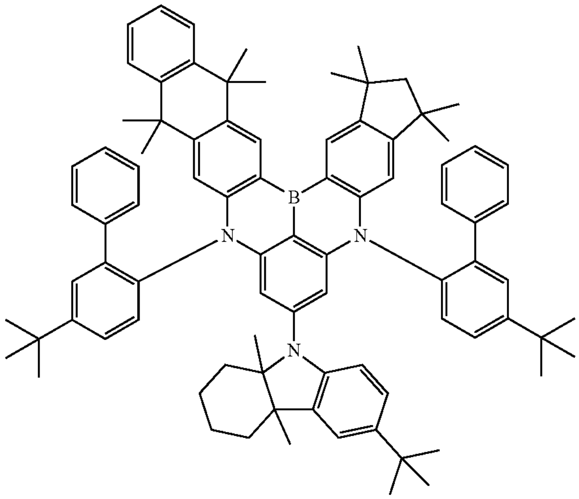

-continued
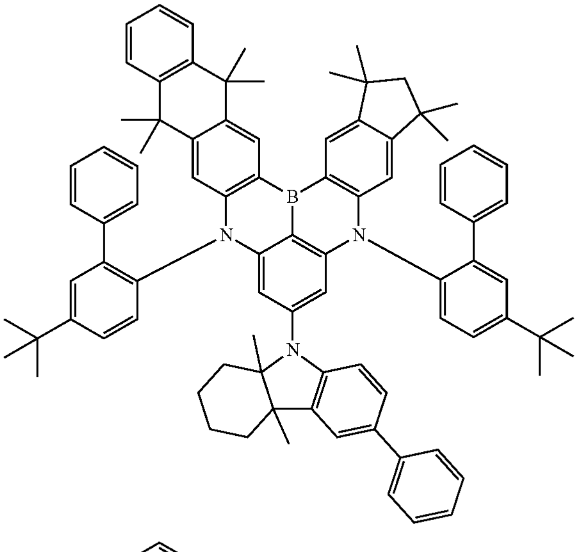
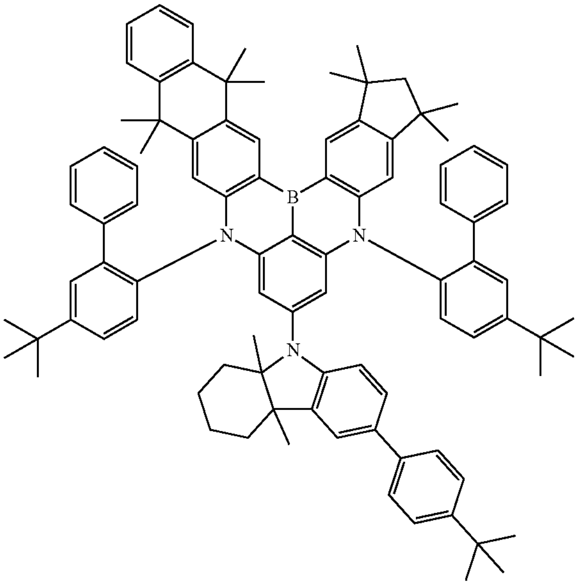 [SMILES: CC(C)(C)c1ccc(-c2ccc3c(c2)C2(C)CCCCC2(C)N3c2cc3c4c(c2)N(c2ccc(C(C)(C)C)cc2-c2ccccc2)c2cc5c(cc2B4c2cc4c(cc2N3c2ccc(C(C)(C)C)cc2-c2ccccc2)C(C)(C)CC4(C)C)C(C)(C)c2ccccc2C5(C)C)cc1]
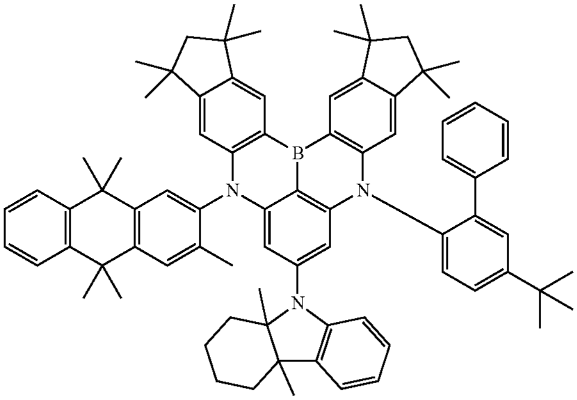
-continued
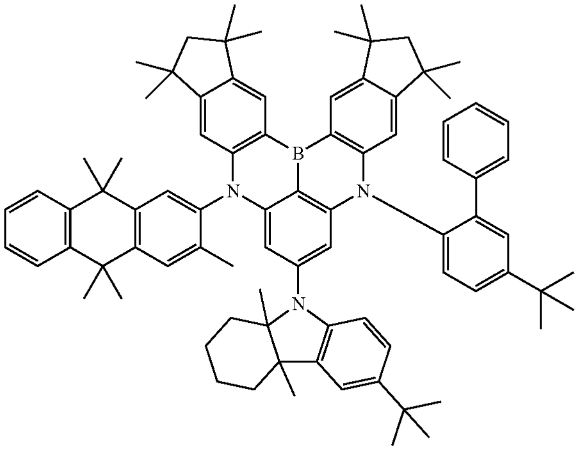
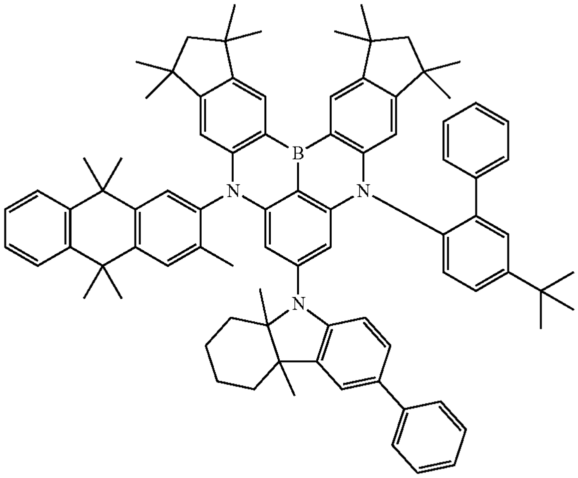
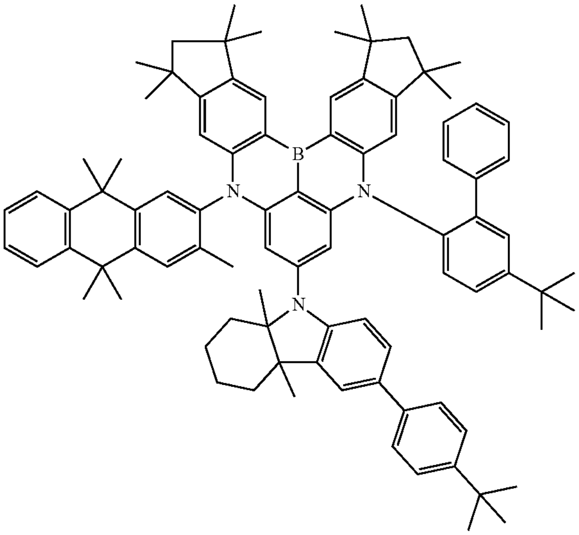 [SMILES: Cc1cc2c(cc1N1c3cc4c(cc3B3c5cc6c(cc5N(c5ccc(C(C)(C)C)cc5-c5ccccc5)c5cc(N7c8ccc(-c9ccc(C(C)(C)C)cc9)cc8C8(C)CCCCC78C)cc1c53)C(C)(C)CC6(C)C)C(C)(C)CC4(C)C)C(C)(C)c1ccccc1C2(C)C]

-continued
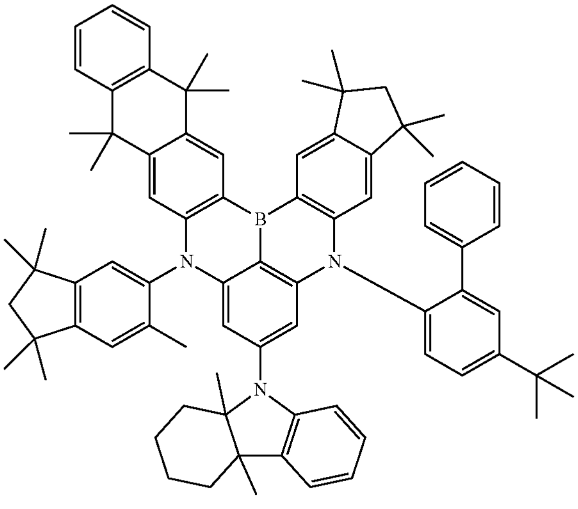
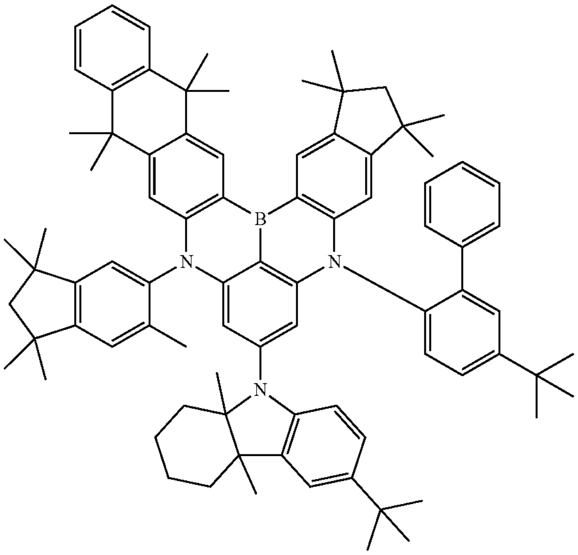
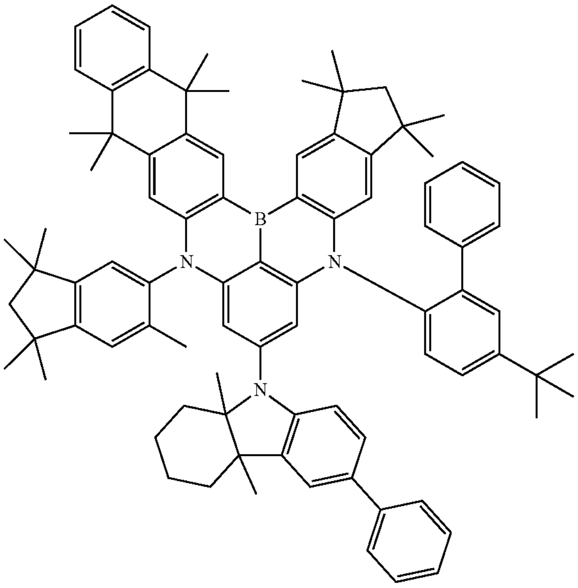
-continued
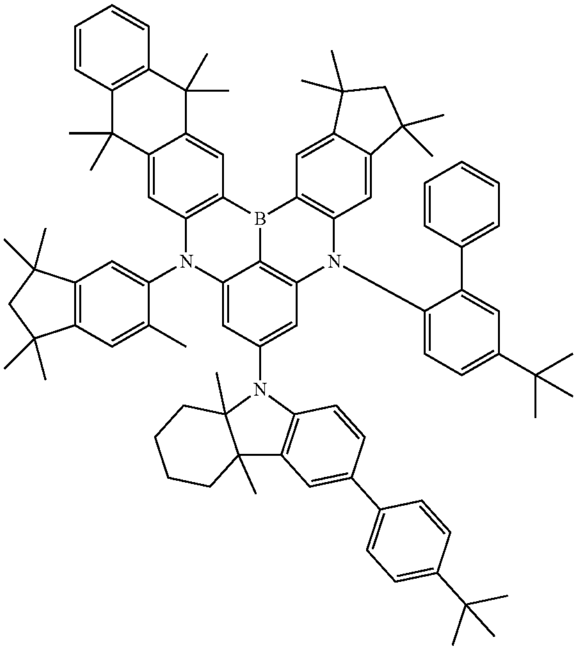 [SMILES: Cc1cc2c(cc1N1c3cc4c(cc3B3c5cc6c(cc5N(c5ccc(C(C)(C)C)cc5-c5ccccc5)c5cc(N7c8ccc(-c9ccc(C(C)(C)C)cc9)cc8C8(C)CCCCC78C)cc1c53)C(C)(C)CC6(C)C)C(C)(C)c1ccccc1C4(C)C)C(C)(C)CC2(C)C]
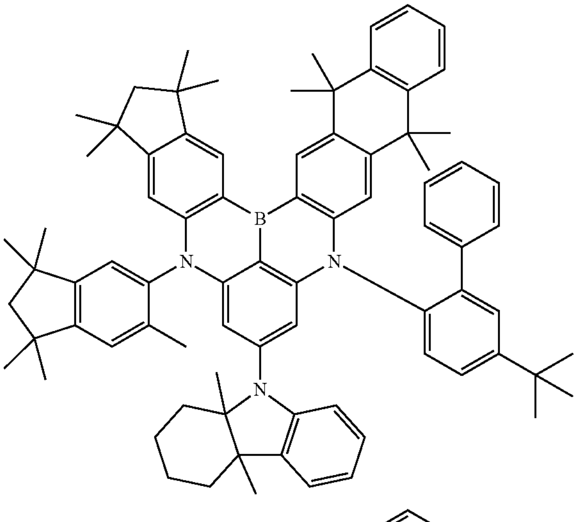
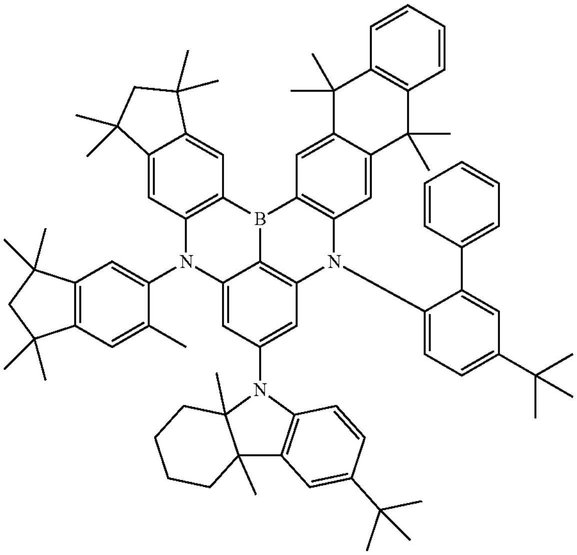

-continued
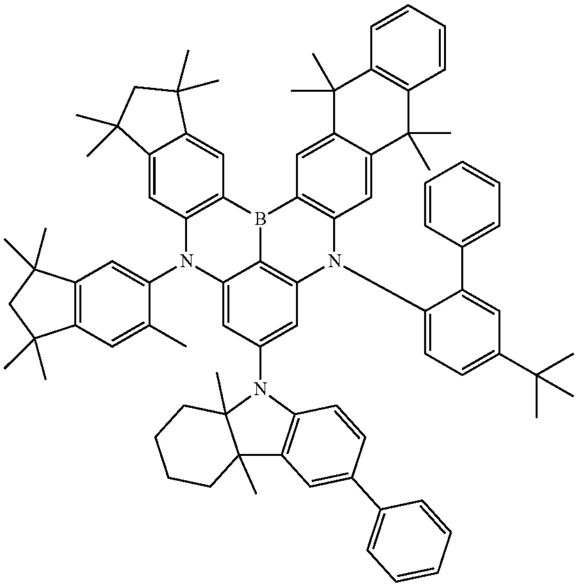
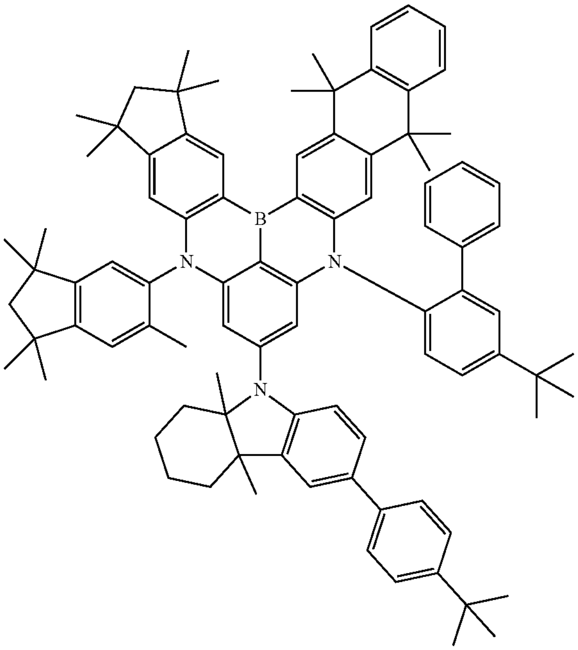 [SMILES: Cc1cc2c(cc1N1c3cc4c(cc3B3c5cc6c(cc5N(c5ccc(C(C)(C)C)cc5-c5ccccc5)c5cc(N7c8ccc(-c9ccc(C(C)(C)C)cc9)cc8C8(C)CCCCC78C)cc1c53)C(C)(C)c1ccccc1C6(C)C)C(C)(C)CC4(C)C)C(C)(C)CC2(C)C]
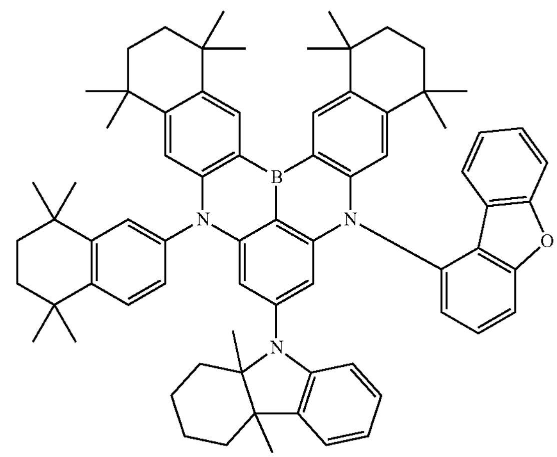
-continued
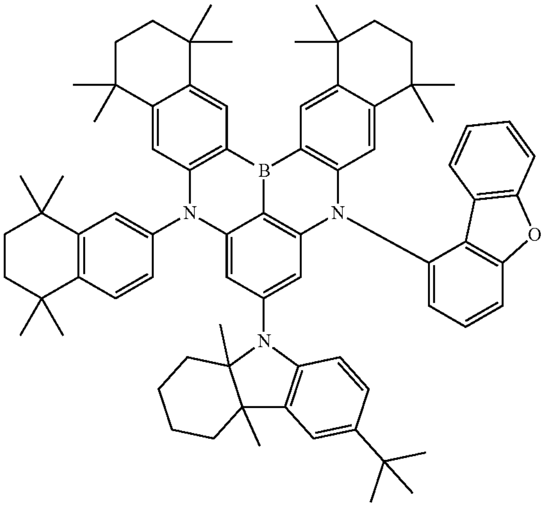
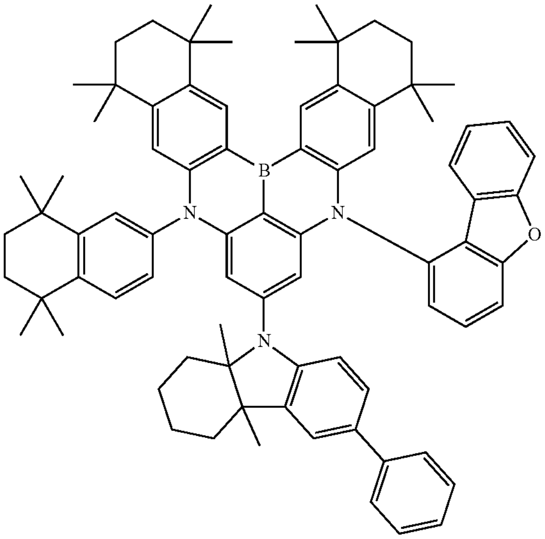
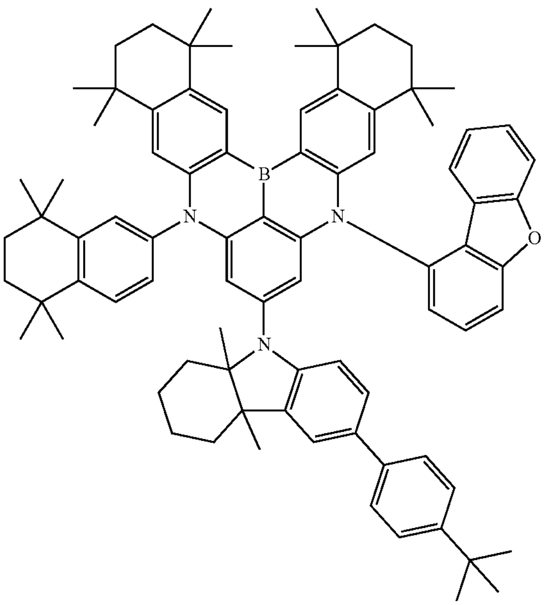 [SMILES: CC(C)(C)c1ccc(-c2ccc3c(c2)C2(C)CCCCC2(C)N3c2cc3c4c(c2)N(c2cccc5oc6ccccc6c25)c2cc5c(cc2B4c2cc4c(cc2N3c2ccc3c(c2)C(C)(C)CCC3(C)C)C(C)(C)CCC4(C)C)C(C)(C)CCC5(C)C)cc1]

-continued
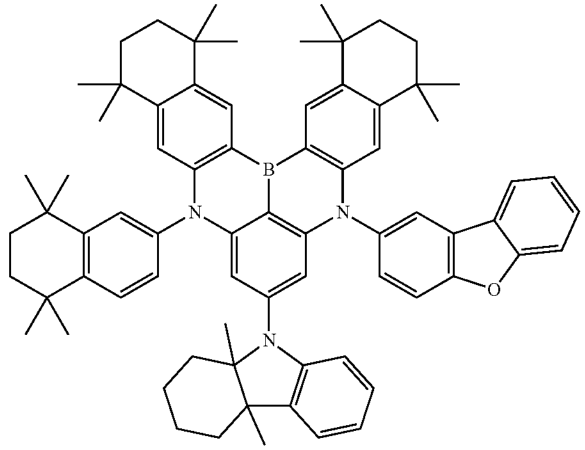
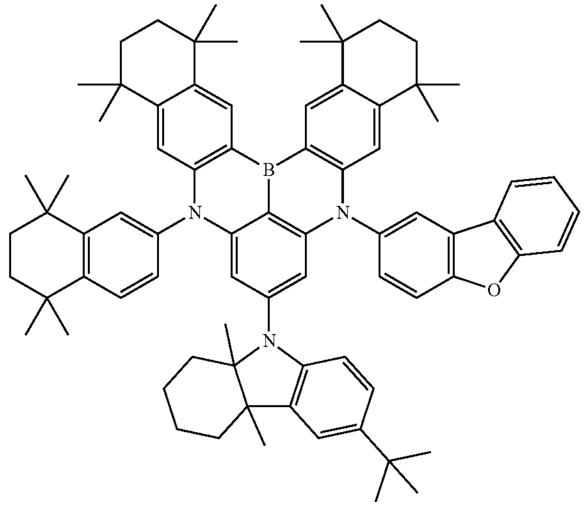
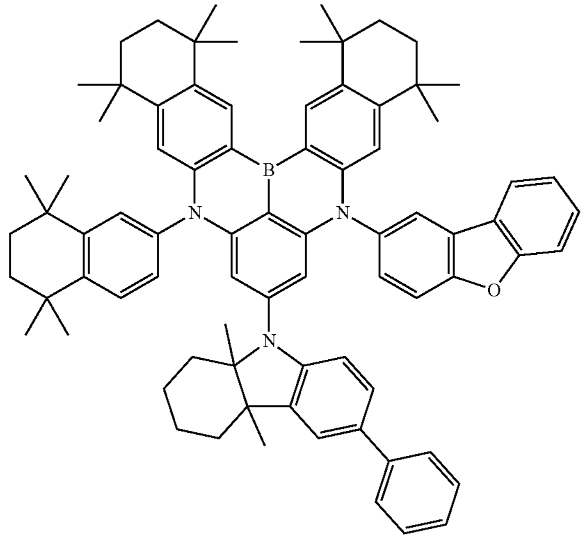
-continued
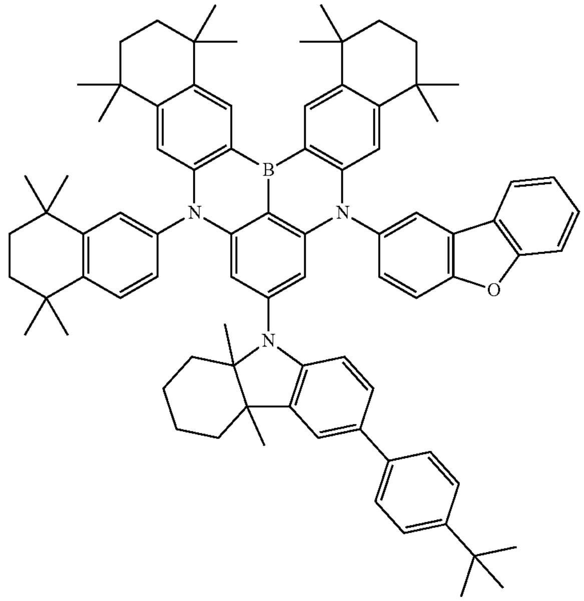
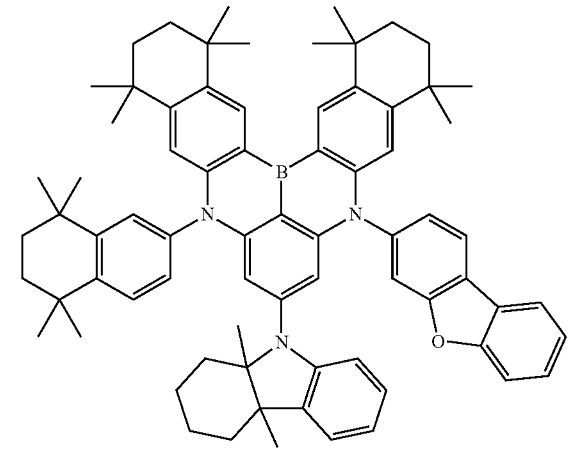
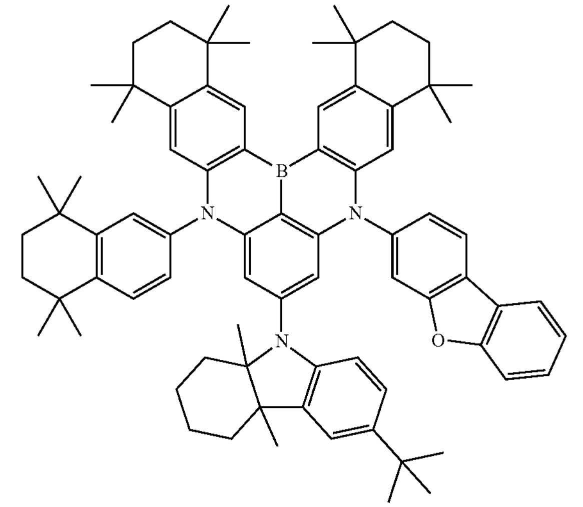

-continued
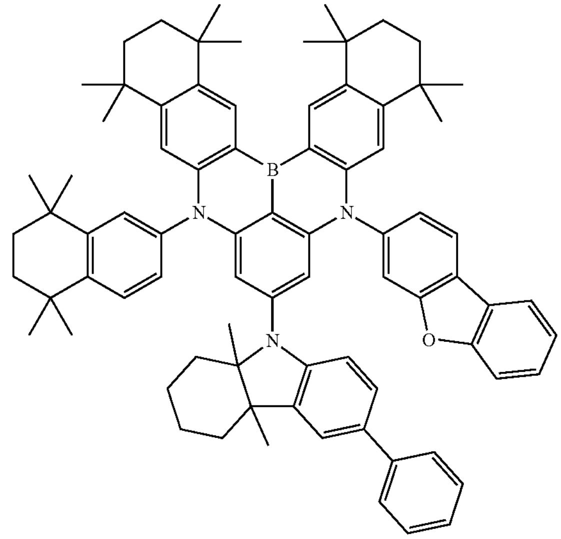
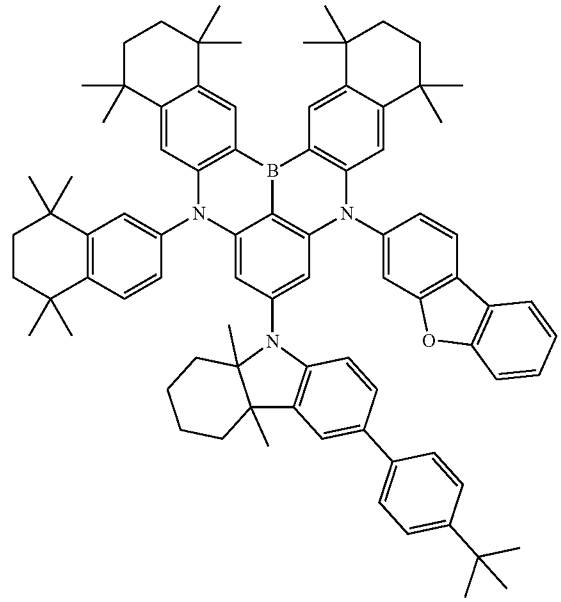 [SMILES: CC(C)(C)c1ccc(-c2ccc3c(c2)C2(C)CCCCC2(C)N3c2cc3c4c(c2)N(c2ccc5c(c2)oc2ccccc25)c2cc5c(cc2B4c2cc4c(cc2N3c2ccc3c(c2)C(C)(C)CCC3(C)C)C(C)(C)CCC4(C)C)C(C)(C)CCC5(C)C)cc1]
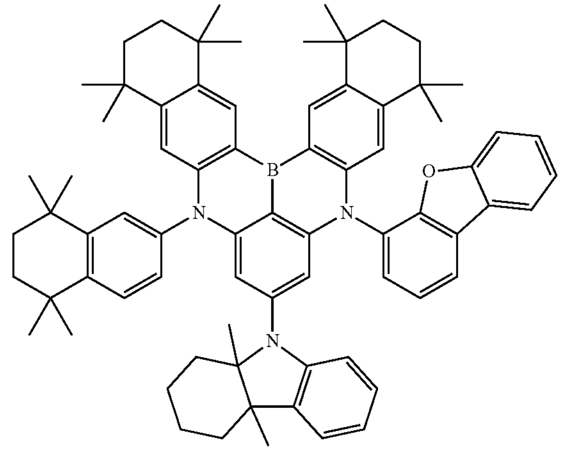
-continued
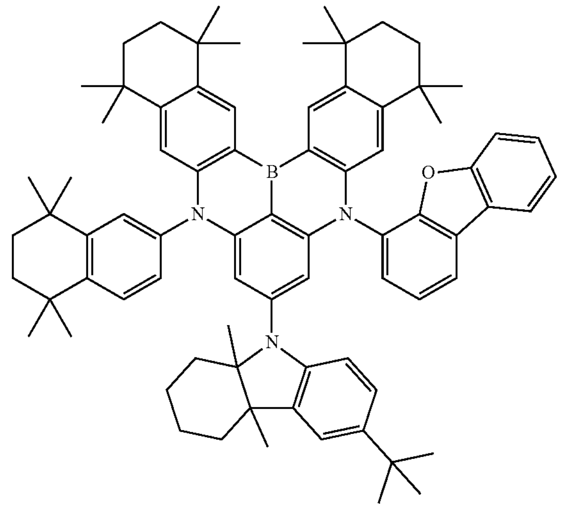
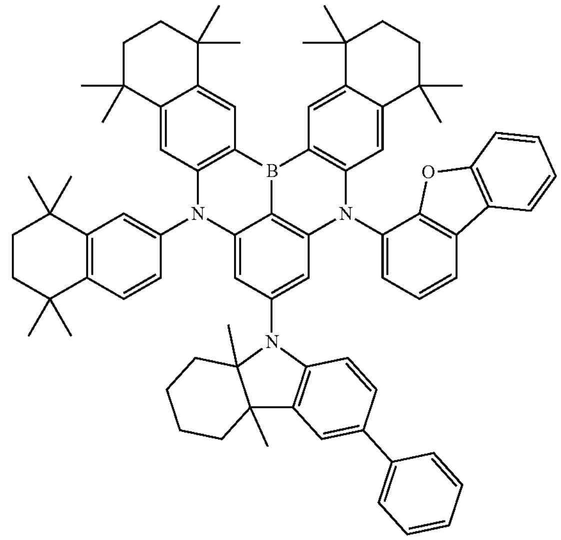
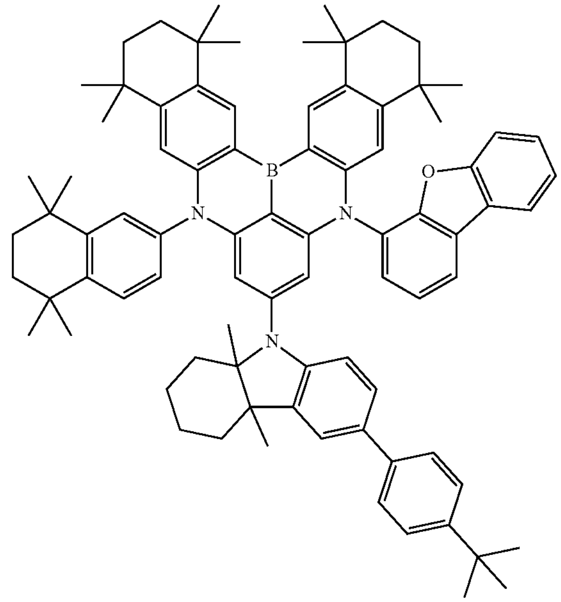 [SMILES: CC(C)(C)c1ccc(-c2ccc3c(c2)C2(C)CCCCC2(C)N3c2cc3c4c(c2)N(c2cccc5c2oc2ccccc25)c2cc5c(cc2B4c2cc4c(cc2N3c2ccc3c(c2)C(C)(C)CCC3(C)C)C(C)(C)CCC4(C)C)C(C)(C)CCC5(C)C)cc1]

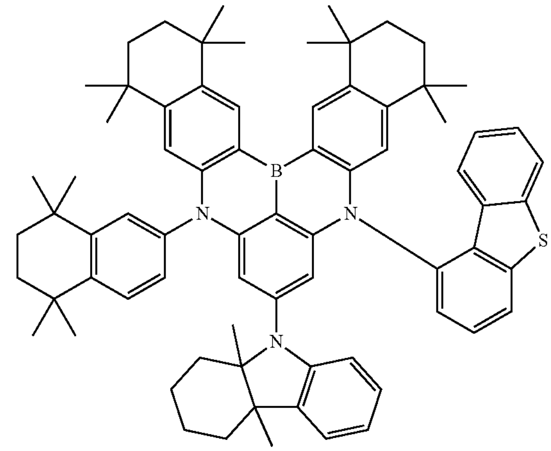
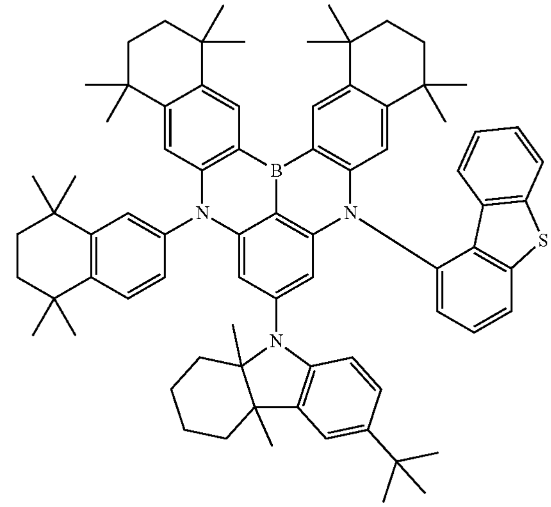
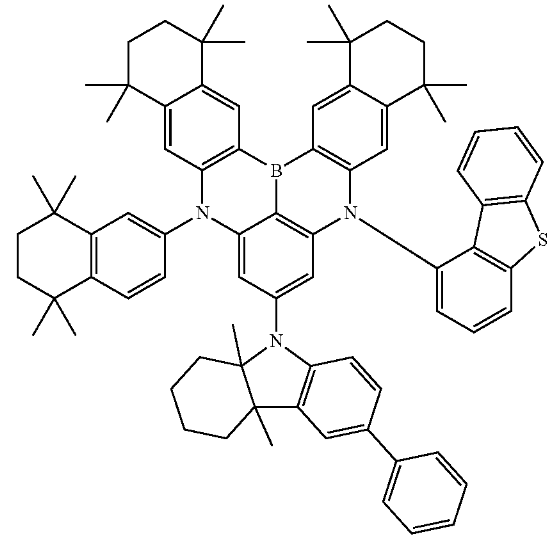
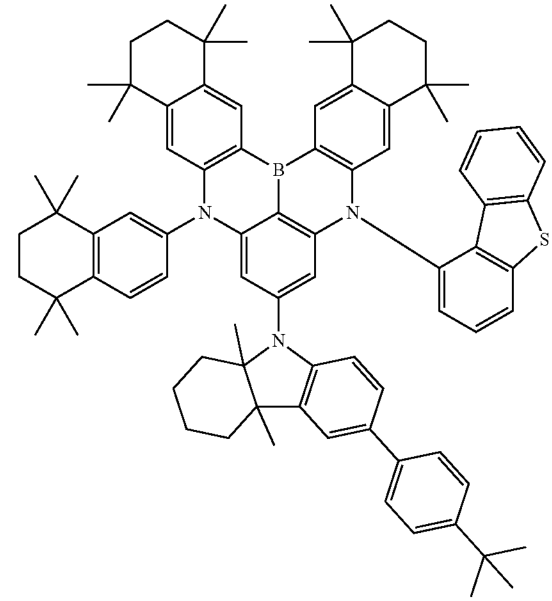 [SMILES: CC(C)(C)c1ccc(-c2ccc3c(c2)C2(C)CCCCC2(C)N3c2cc3c4c(c2)N(c2cccc5sc6ccccc6c25)c2cc5c(cc2B4c2cc4c(cc2N3c2ccc3c(c2)C(C)(C)CCC3(C)C)C(C)(C)CCC4(C)C)C(C)(C)CCC5(C)C)cc1]
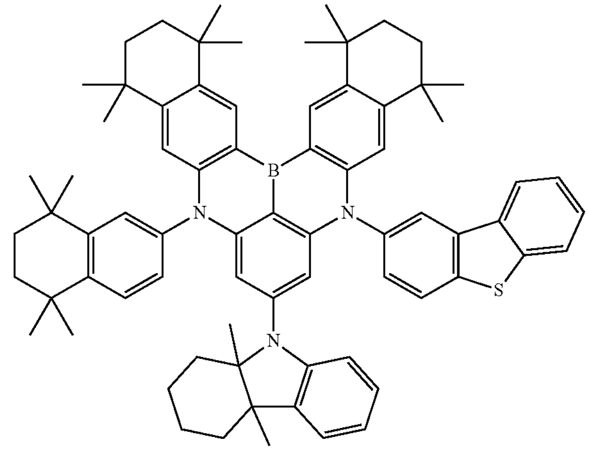
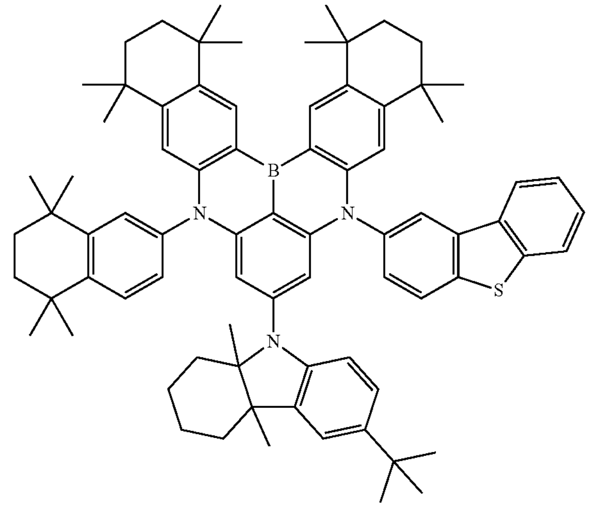

-continued
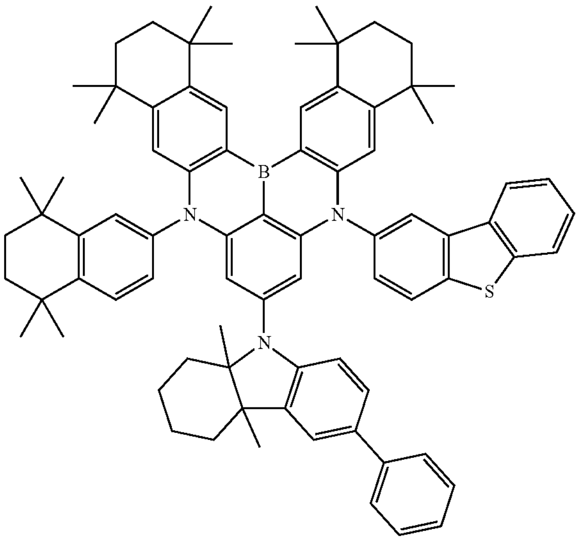
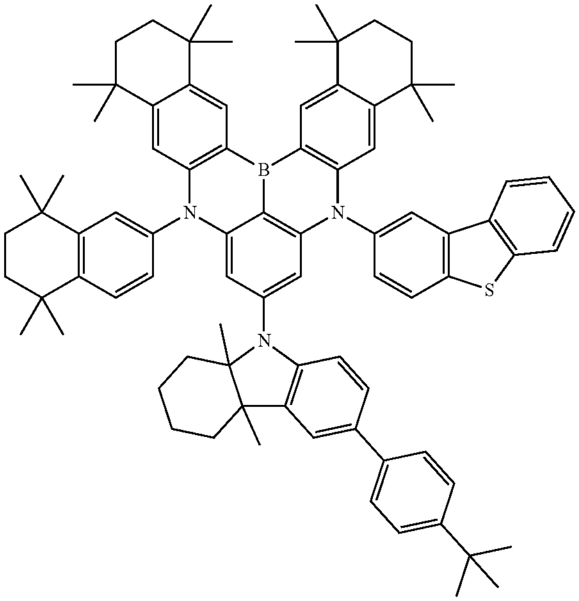
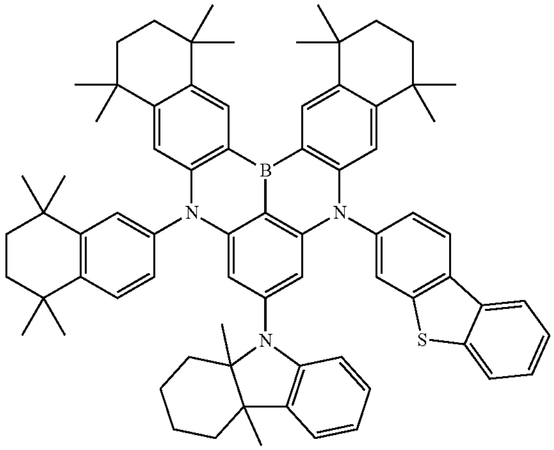
-continued
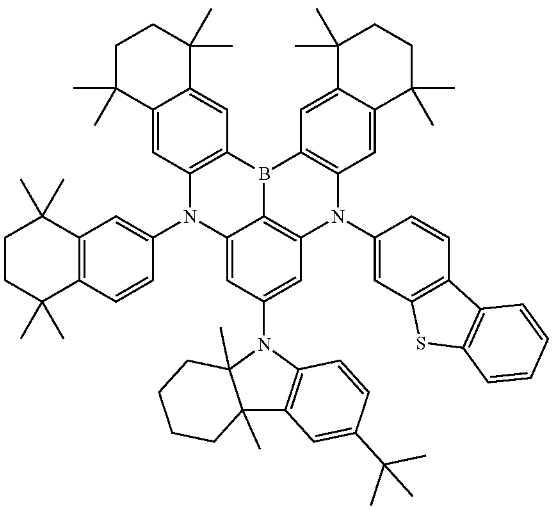
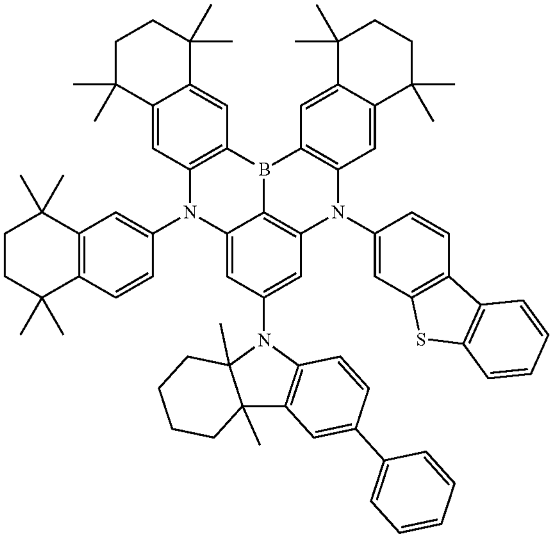
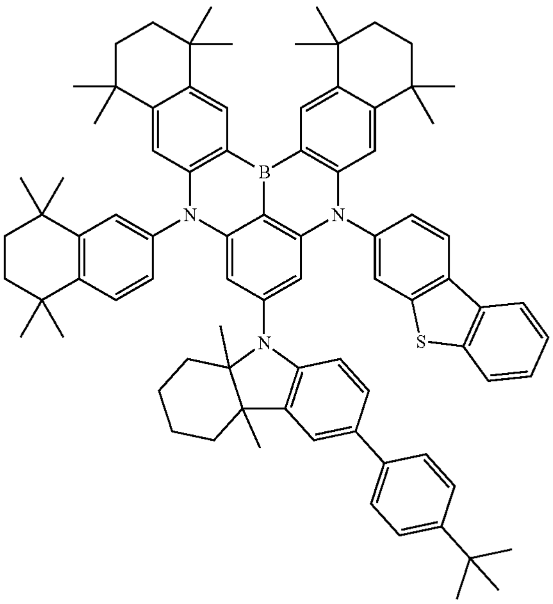 [SMILES: CC(C)(C)c1ccc(-c2ccc3c(c2)C2(C)CCCCC2(C)N3c2cc3c4c(c2)N(c2ccc5c(c2)sc2ccccc25)c2cc5c(cc2B4c2cc4c(cc2N3c2ccc3c(c2)C(C)(C)CCC3(C)C)C(C)(C)CCC4(C)C)C(C)(C)CCC5(C)C)cc1]

-continued
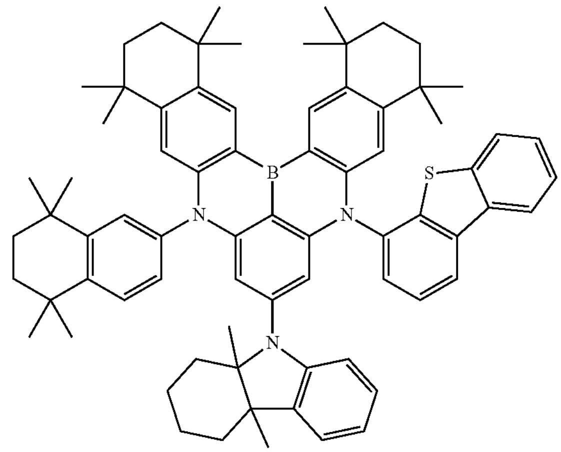
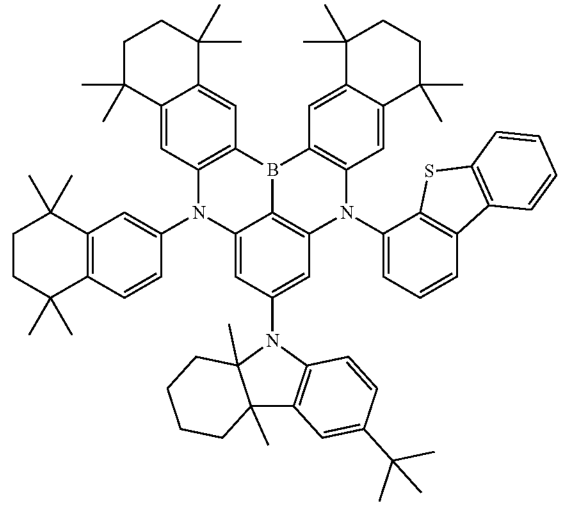
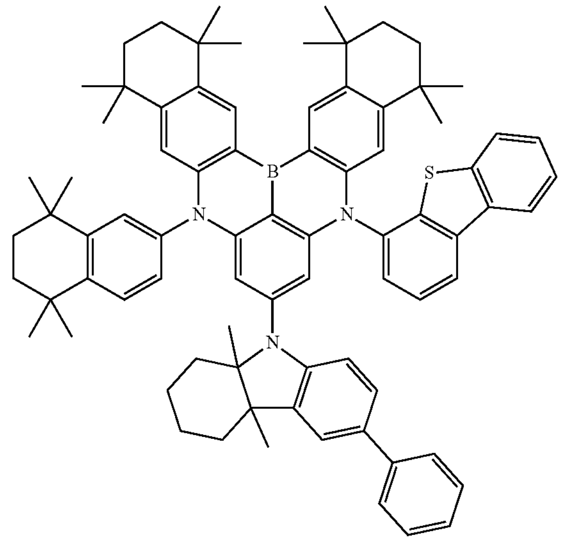
-continued
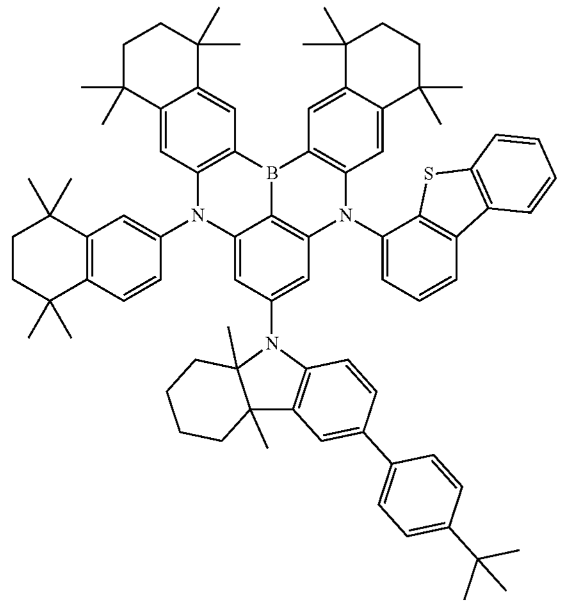
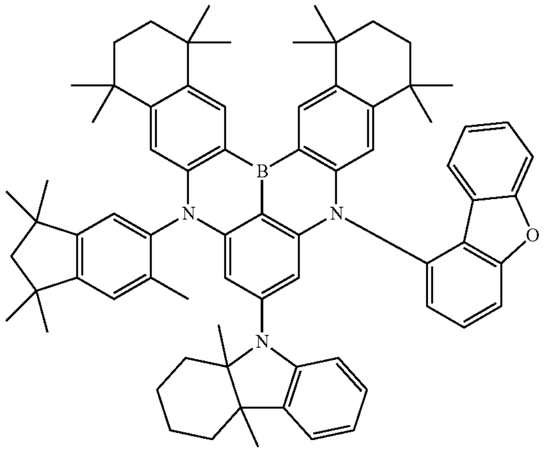
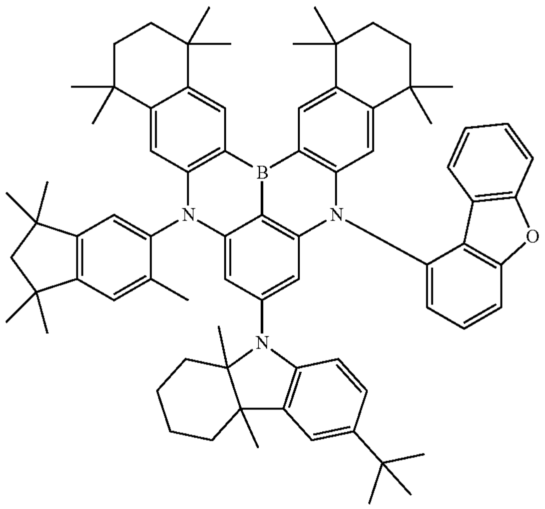

-continued
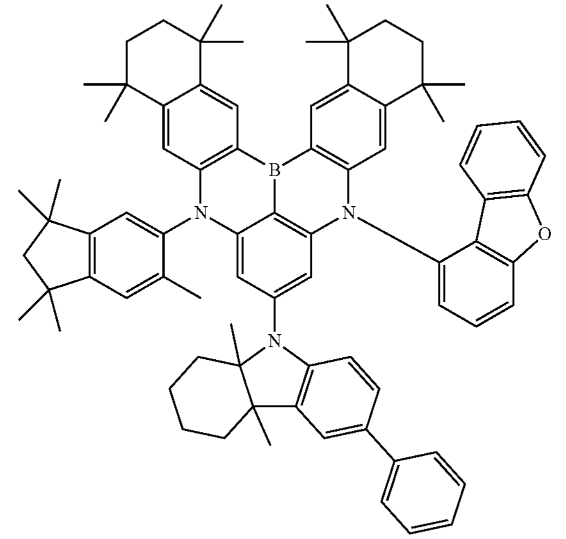
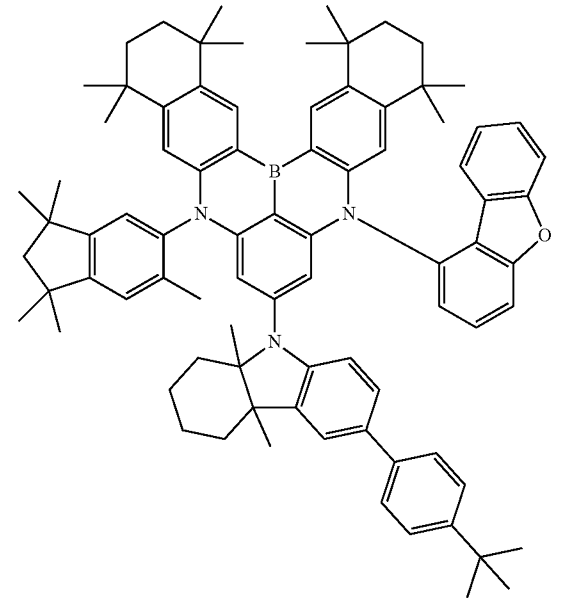 [SMILES: Cc1cc2c(cc1N1c3cc4c(cc3B3c5cc6c(cc5N(c5cccc7oc8ccccc8c57)c5cc(N7c8ccc(-c9ccc(C(C)(C)C)cc9)cc8C8(C)CCCCC78C)cc1c53)C(C)(C)CCC6(C)C)C(C)(C)CCC4(C)C)C(C)(C)CC2(C)C]
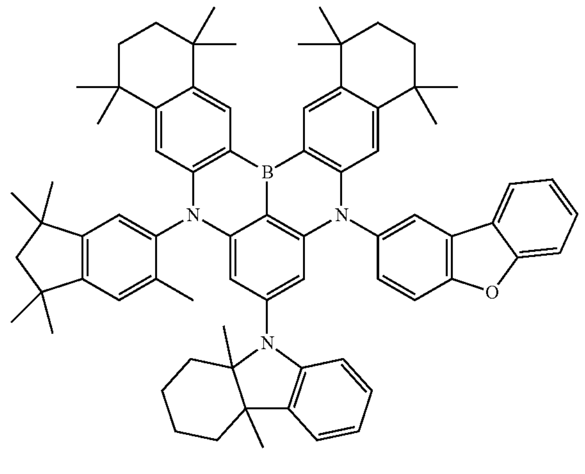
-continued
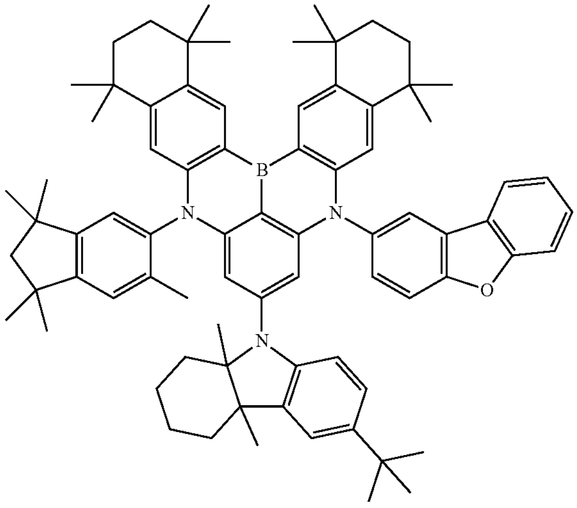
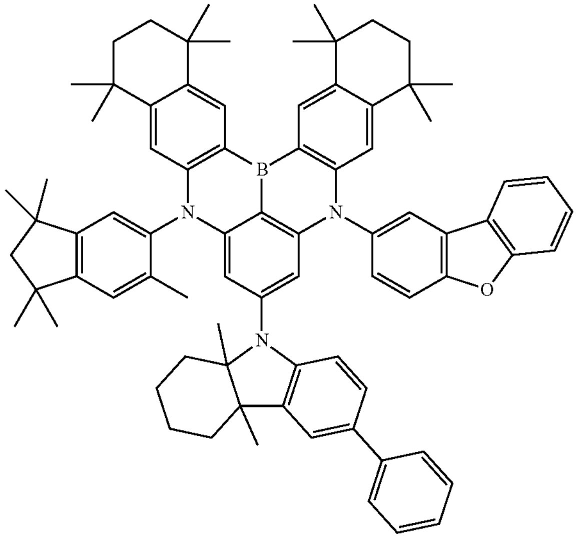
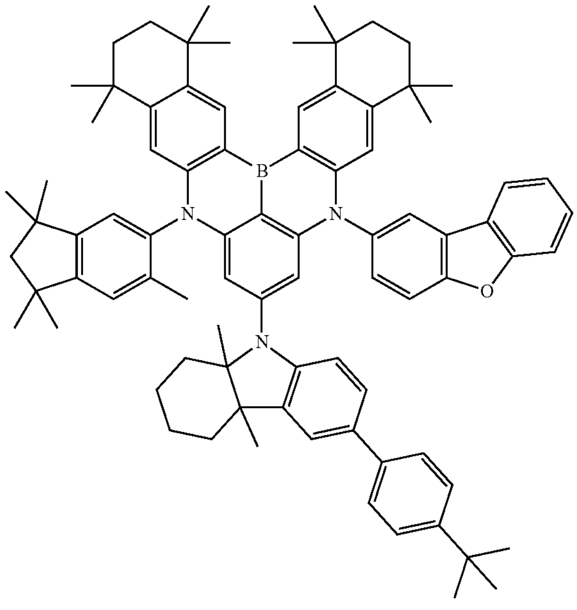 [SMILES: Cc1cc2c(cc1N1c3cc4c(cc3B3c5cc6c(cc5N(c5ccc7oc8ccccc8c7c5)c5cc(N7c8ccc(-c9ccc(C(C)(C)C)cc9)cc8C8(C)CCCCC78C)cc1c53)C(C)(C)CCC6(C)C)C(C)(C)CCC4(C)C)C(C)(C)CC2(C)C]

-continued
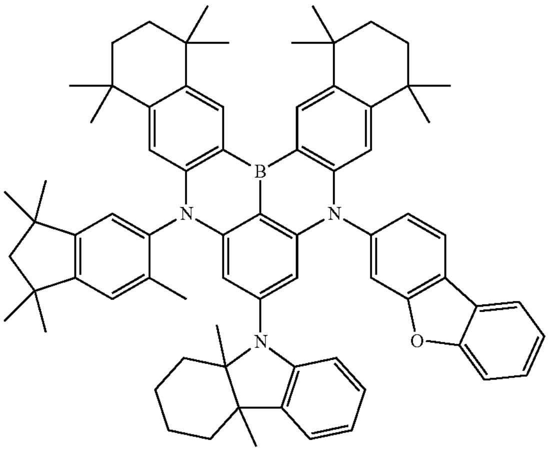
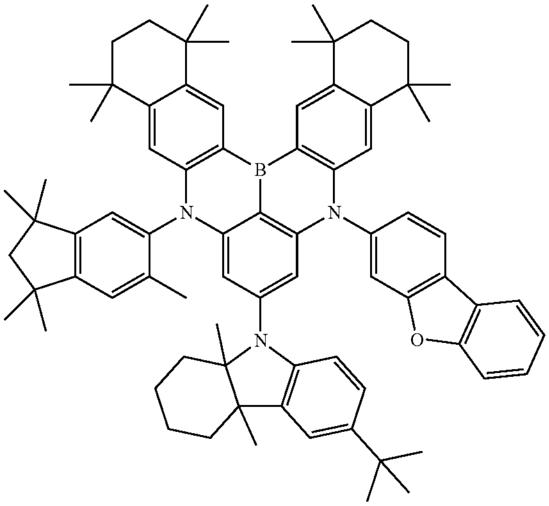
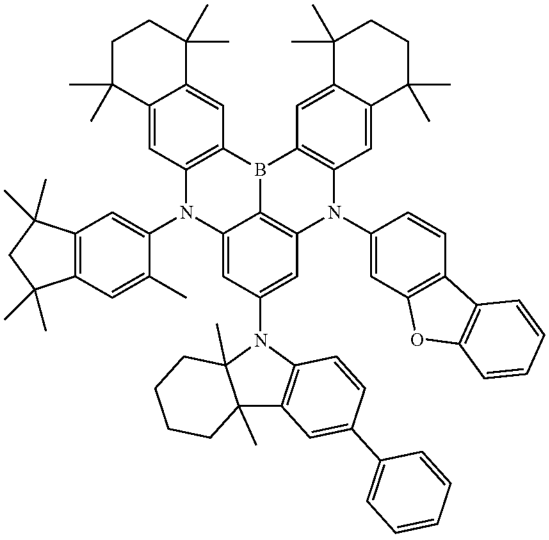
-continued
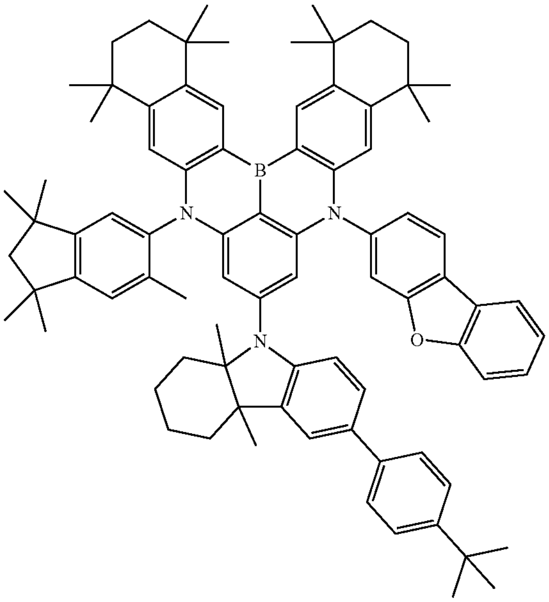 [SMILES: Cc1cc2c(cc1N1c3cc4c(cc3B3c5cc6c(cc5N(c5ccc7c(c5)oc5ccccc57)c5cc(N7c8ccc(-c9ccc(C(C)(C)C)cc9)cc8C8(C)CCCCC78C)cc1c53)C(C)(C)CCC6(C)C)C(C)(C)CCC4(C)C)C(C)(C)CC2(C)C]
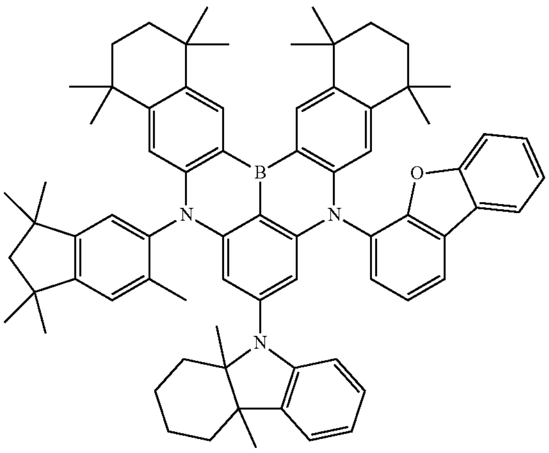
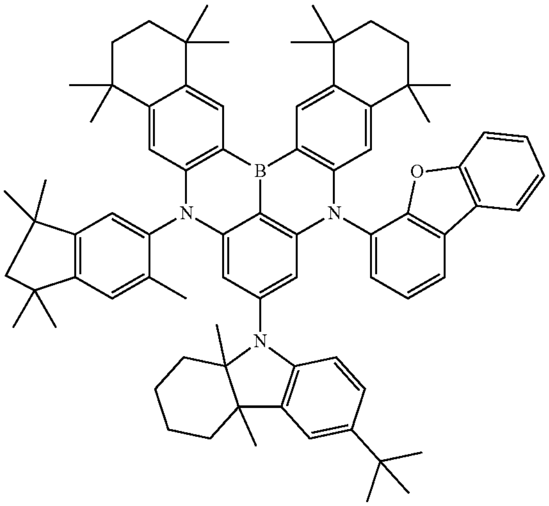

-continued
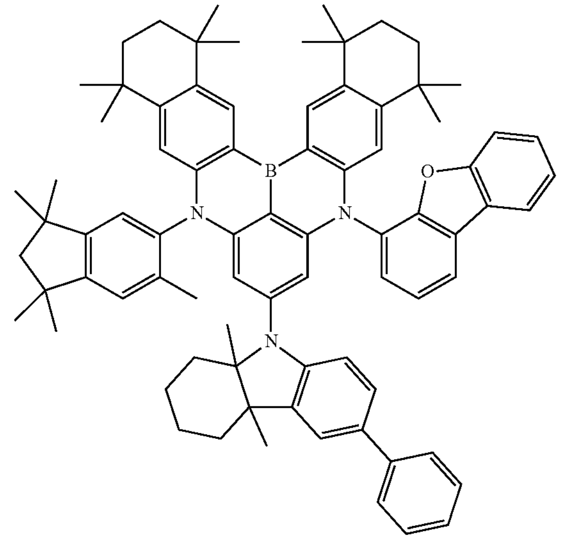
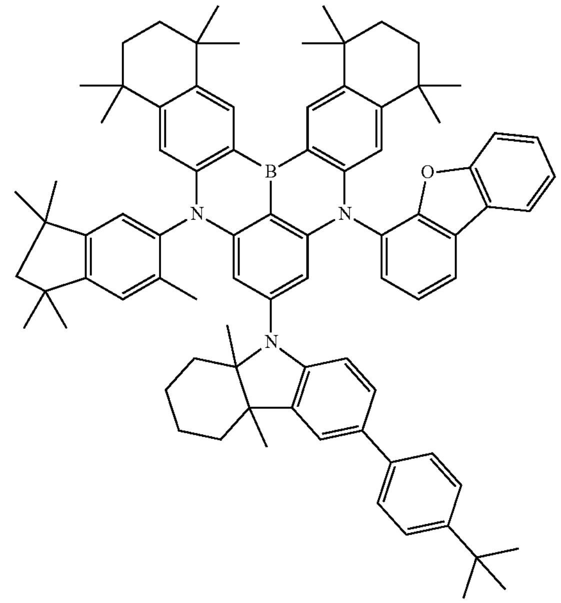 [SMILES: Cc1cc2c(cc1N1c3cc4c(cc3B3c5cc6c(cc5N(c5cccc7c5oc5ccccc57)c5cc(N7c8ccc(-c9ccc(C(C)(C)C)cc9)cc8C8(C)CCCCC78C)cc1c53)C(C)(C)CCC6(C)C)C(C)(C)CCC4(C)C)C(C)(C)CC2(C)C]
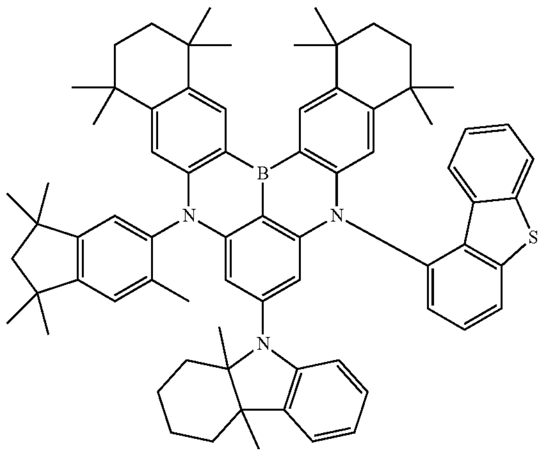
-continued
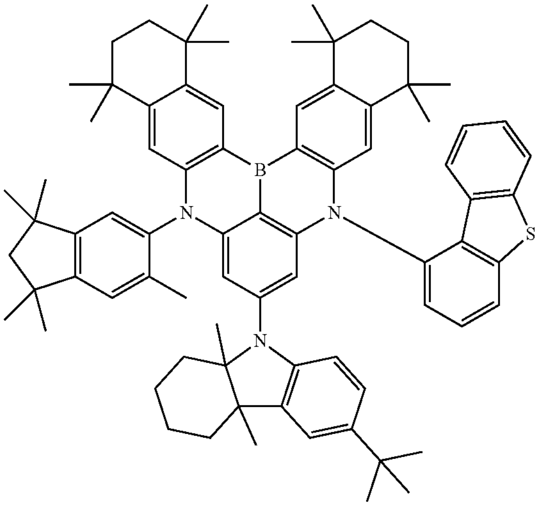
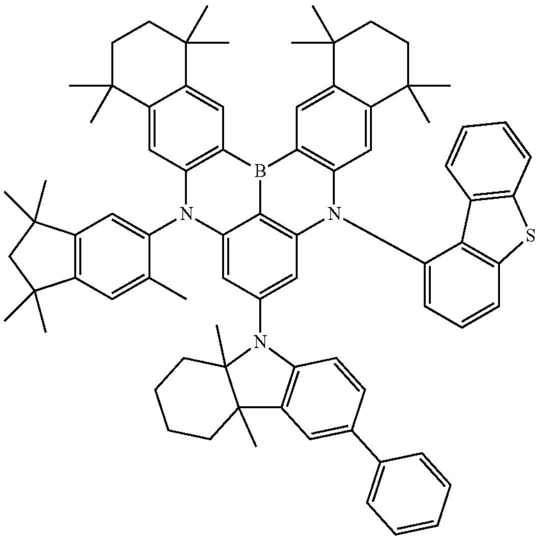
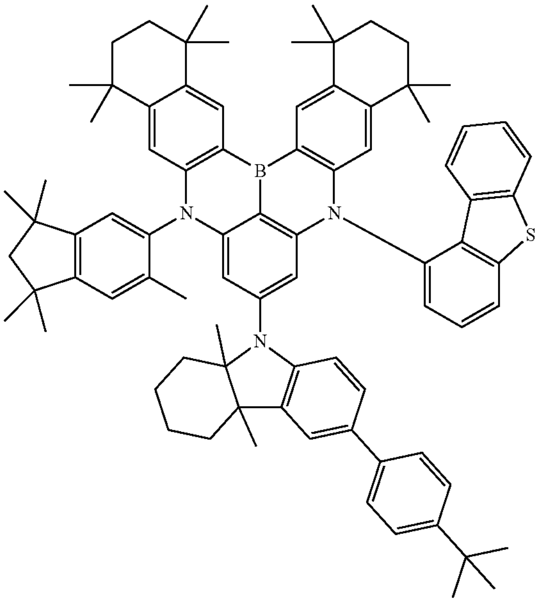 [SMILES: Cc1cc2c(cc1N1c3cc4c(cc3B3c5cc6c(cc5N(c5cccc7sc8ccccc8c57)c5cc(N7c8ccc(-c9ccc(C(C)(C)C)cc9)cc8C8(C)CCCCC78C)cc1c53)C(C)(C)CCC6(C)C)C(C)(C)CCC4(C)C)C(C)(C)CC2(C)C]

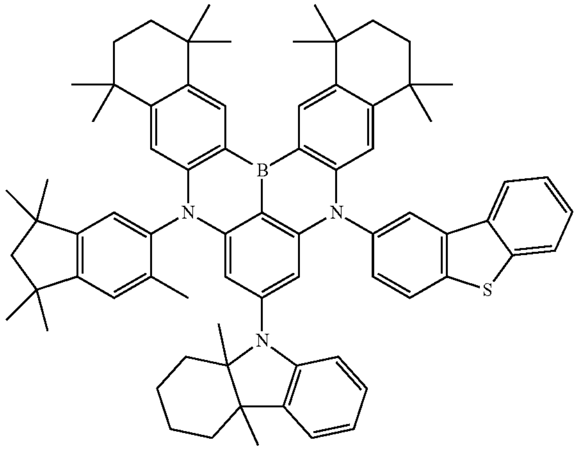
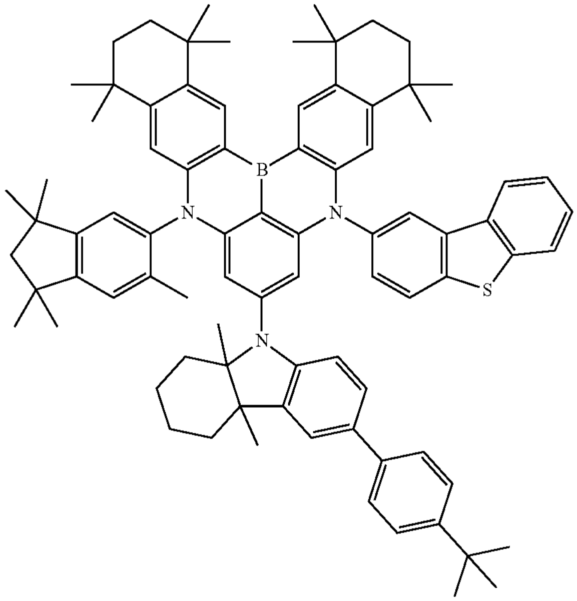
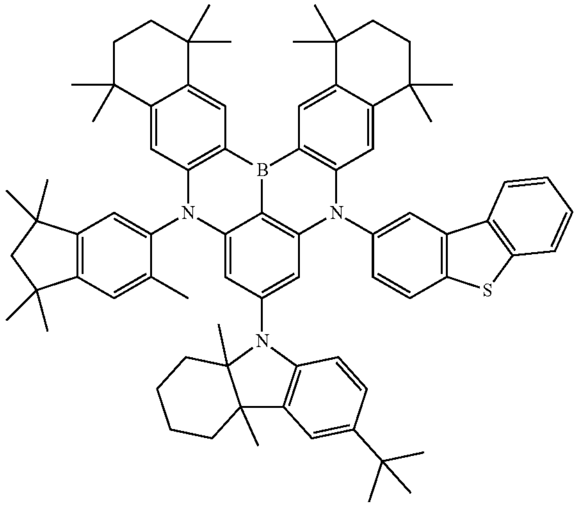
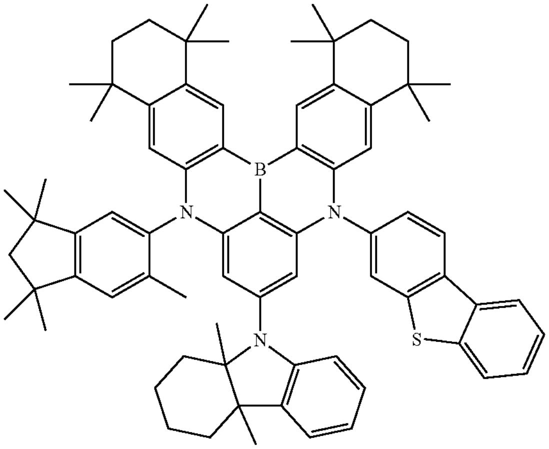
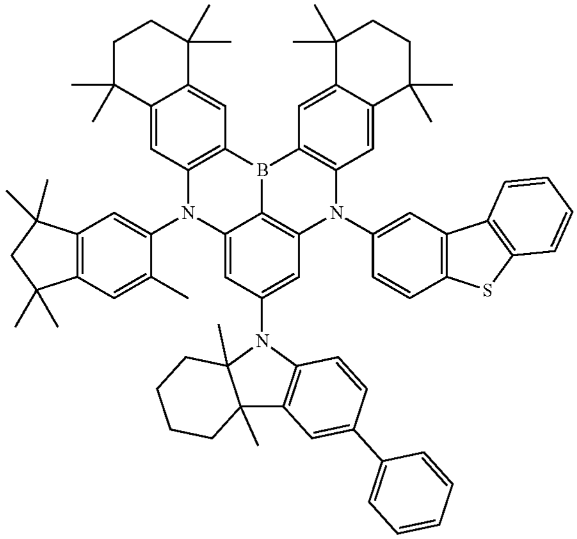
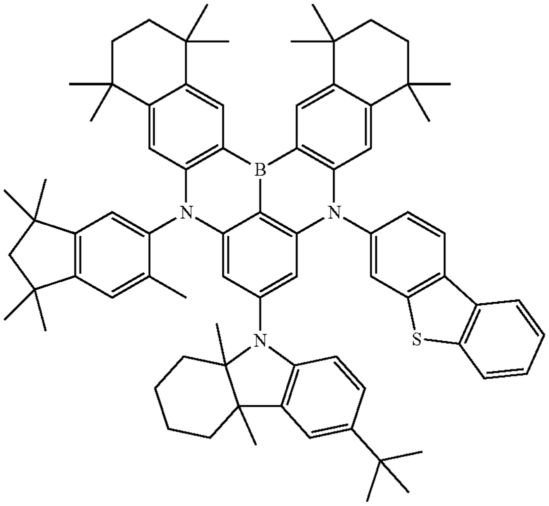

-continued
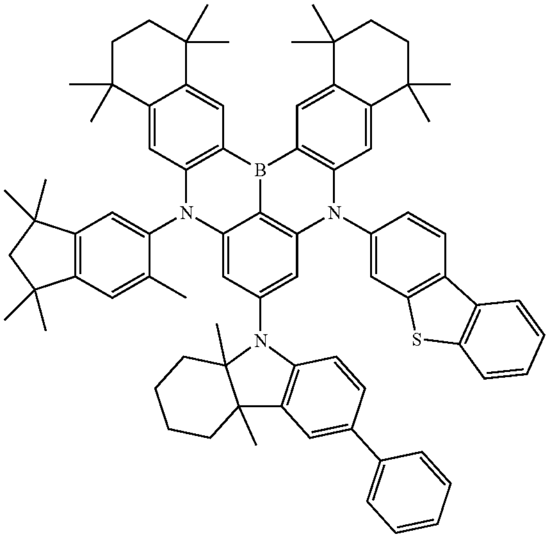
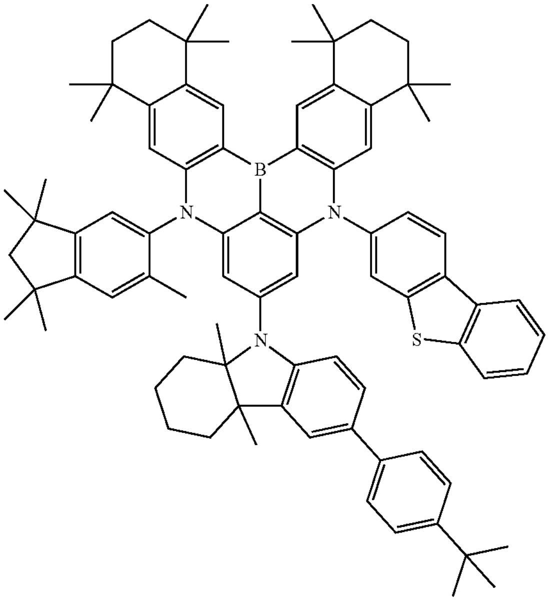
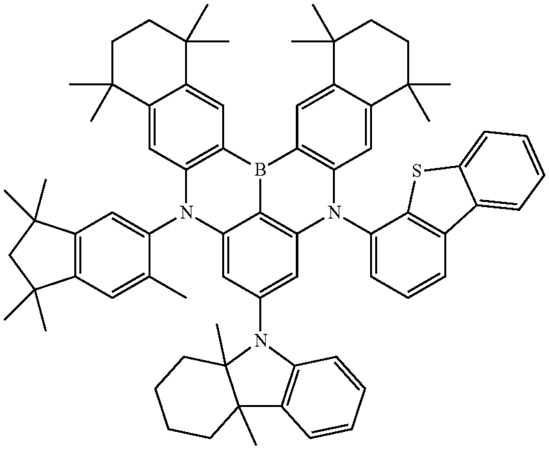
-continued
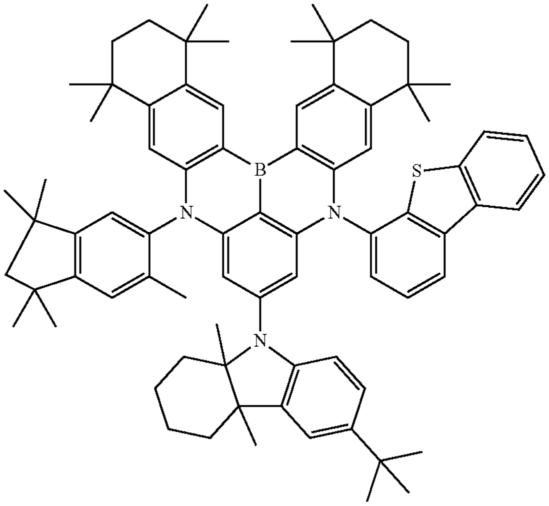
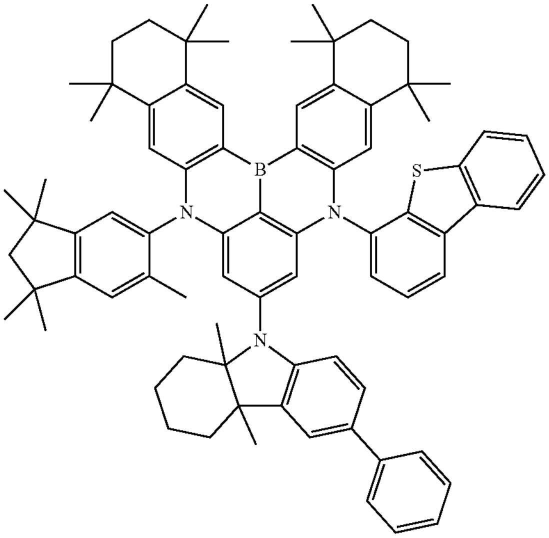
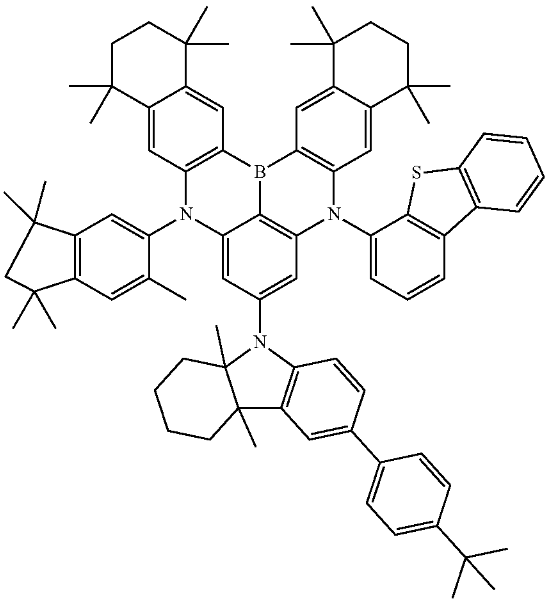

-continued
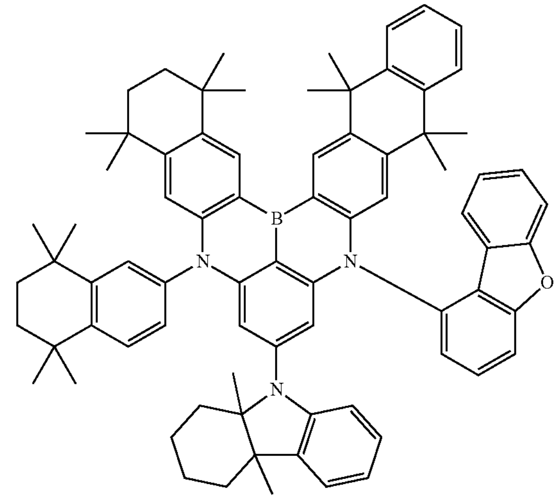
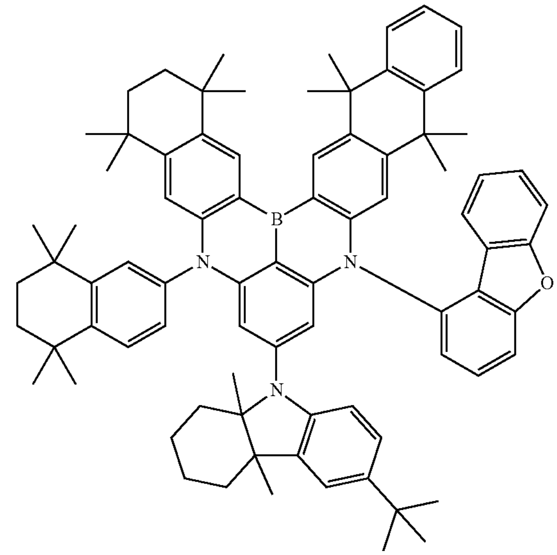
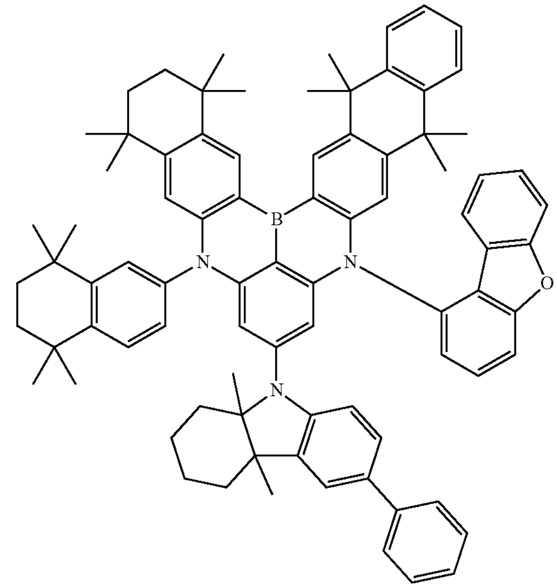
-continued
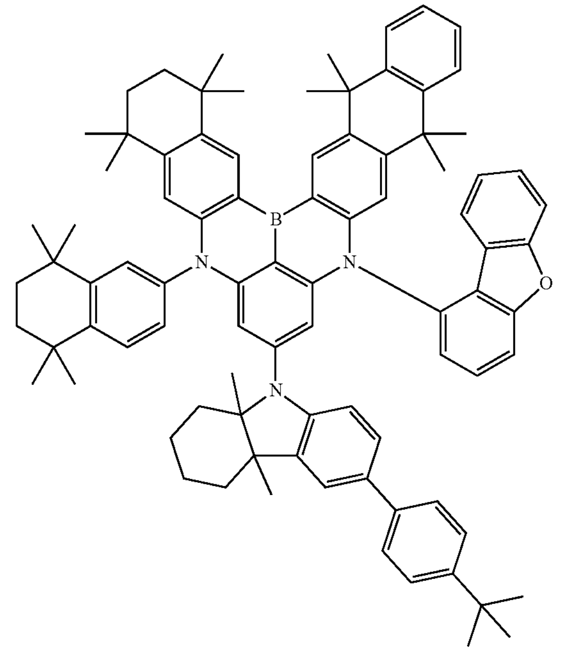 [SMILES: CC(C)(C)c1ccc(-c2ccc3c(c2)C2(C)CCCCC2(C)N3c2cc3c4c(c2)N(c2cccc5oc6ccccc6c25)c2cc5c(cc2B4c2cc4c(cc2N3c2ccc3c(c2)C(C)(C)CCC3(C)C)C(C)(C)CCC4(C)C)C(C)(C)c2ccccc2C5(C)C)cc1]
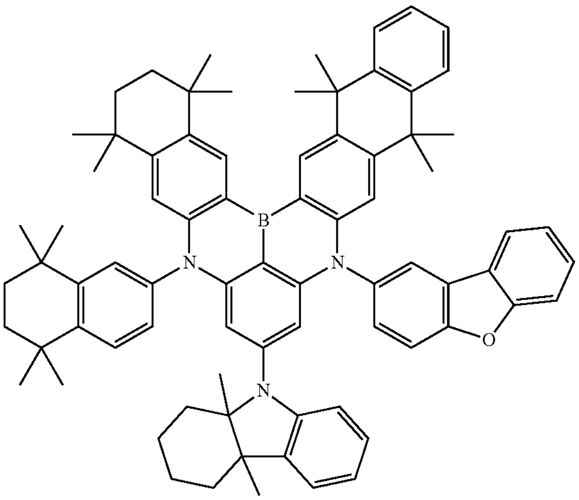
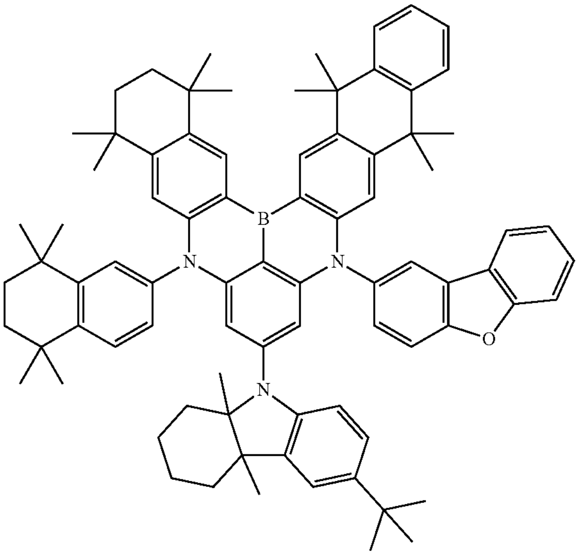

-continued
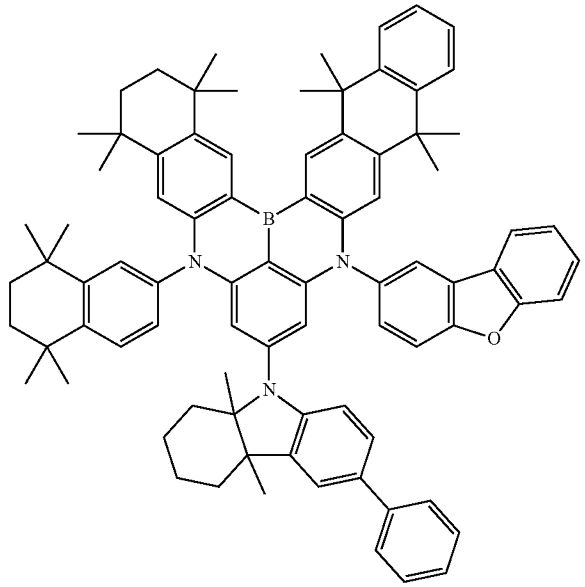
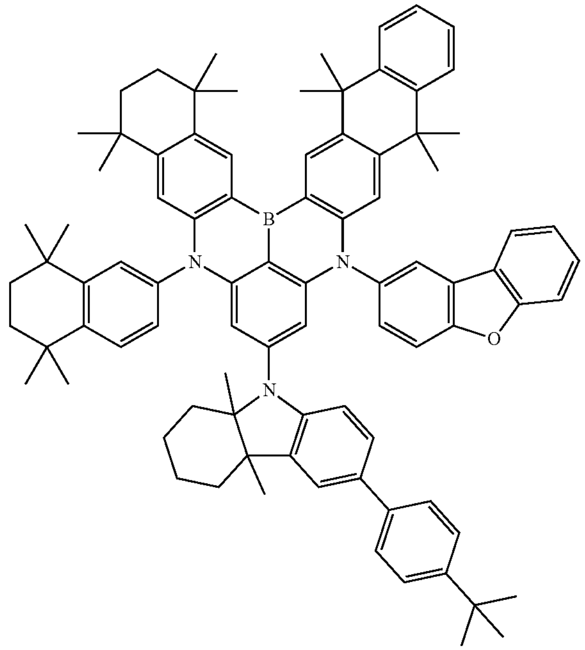 [SMILES: CC(C)(C)c1ccc(-c2ccc3c(c2)C2(C)CCCCC2(C)N3c2cc3c4c(c2)N(c2ccc5oc6ccccc6c5c2)c2cc5c(cc2B4c2cc4c(cc2N3c2ccc3c(c2)C(C)(C)CCC3(C)C)C(C)(C)CCC4(C)C)C(C)(C)c2ccccc2C5(C)C)cc1]
-continued
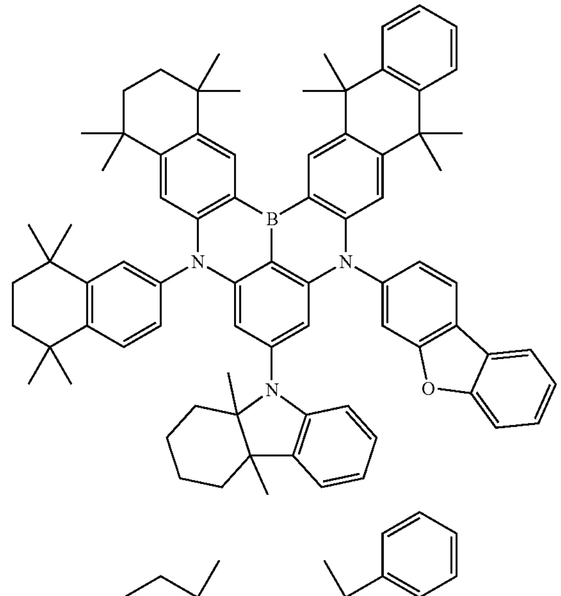
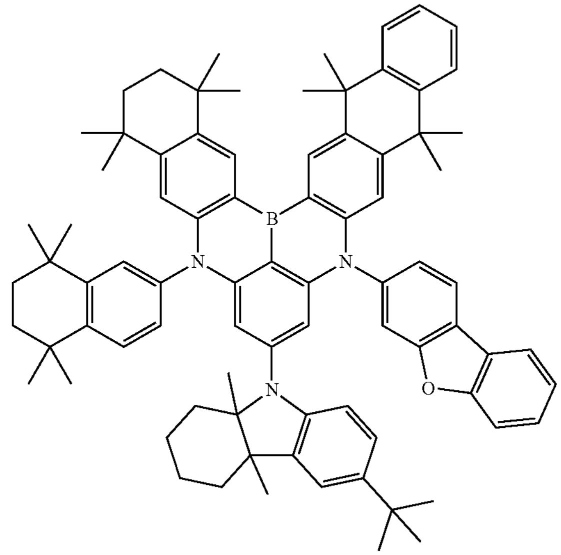
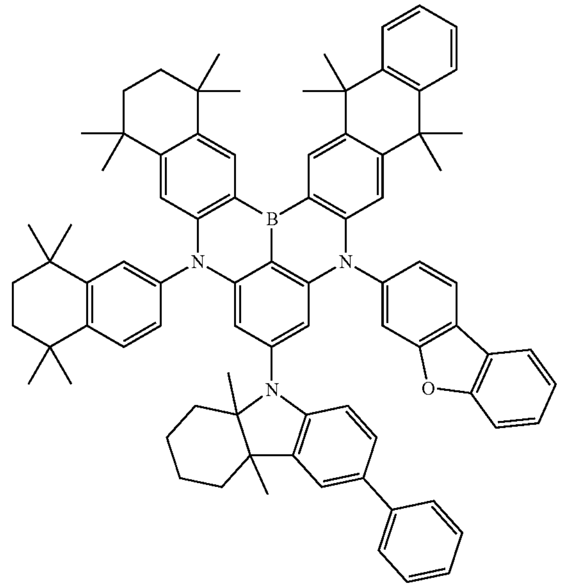

-continued
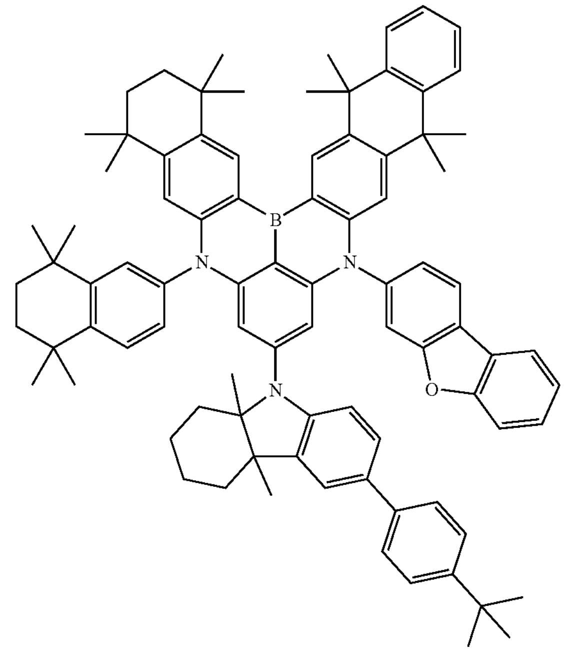 [SMILES: CC(C)(C)c1ccc(-c2ccc3c(c2)C2(C)CCCCC2(C)N3c2cc3c4c(c2)N(c2ccc5c(c2)oc2ccccc25)c2cc5c(cc2B4c2cc4c(cc2N3c2ccc3c(c2)C(C)(C)CCC3(C)C)C(C)(C)CCC4(C)C)C(C)(C)c2ccccc2C5(C)C)cc1]
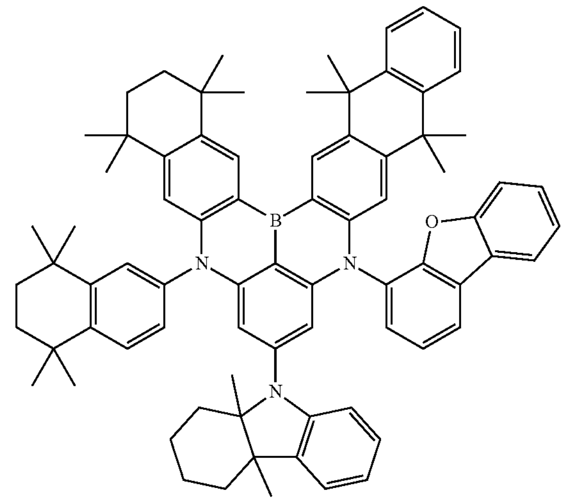
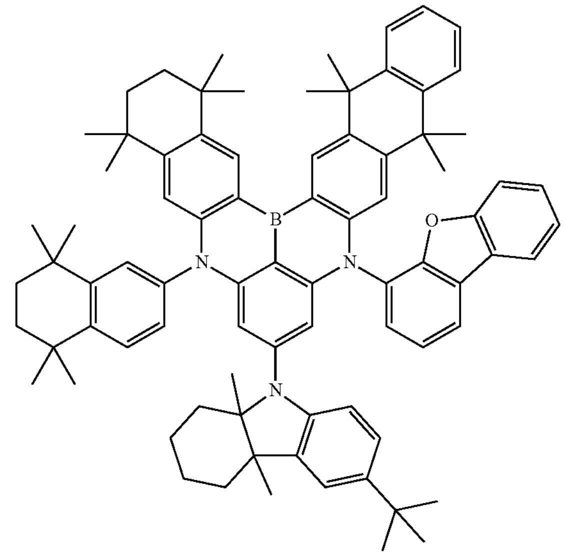
-continued
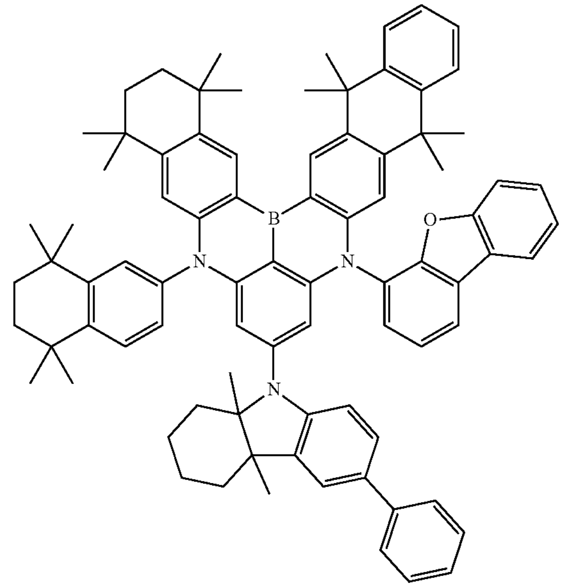
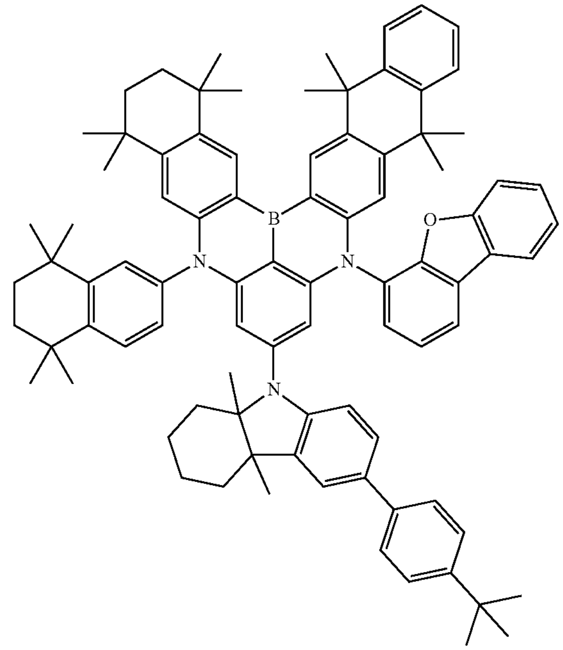

-continued
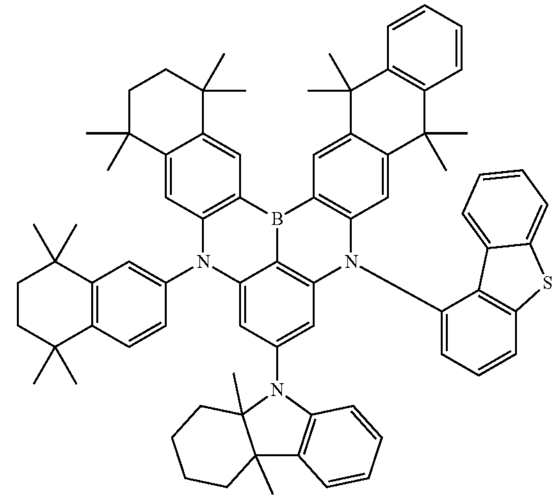
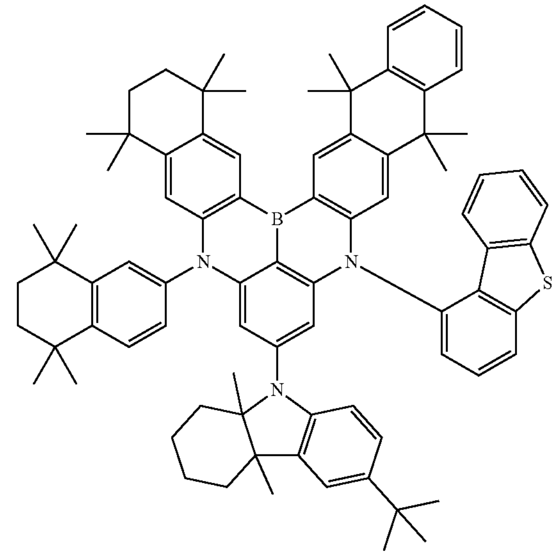
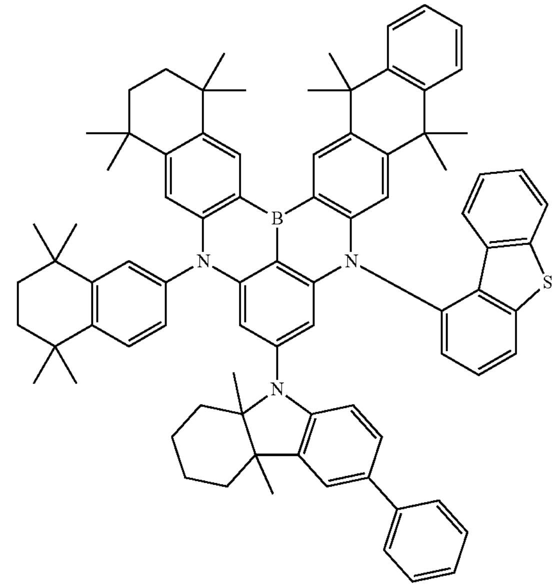
-continued
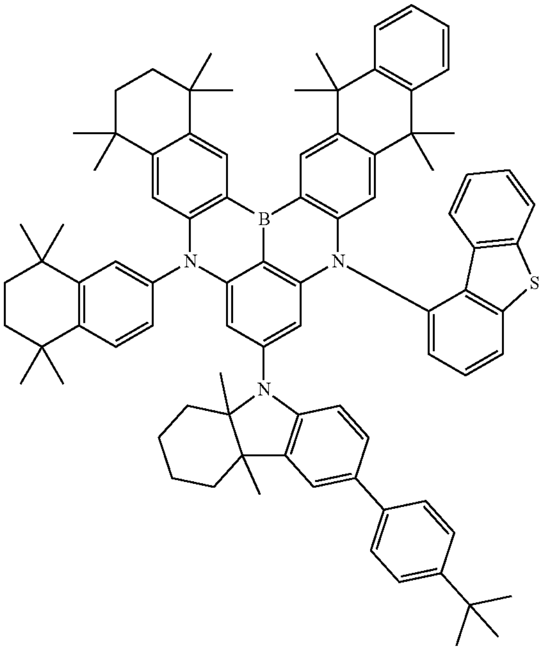 [SMILES: CC(C)(C)c1ccc(-c2ccc3c(c2)C2(C)CCCCC2(C)N3c2cc3c4c(c2)N(c2cccc5sc6ccccc6c25)c2cc5c(cc2B4c2cc4c(cc2N3c2ccc3c(c2)C(C)(C)CCC3(C)C)C(C)(C)CCC4(C)C)C(C)(C)c2ccccc2C5(C)C)cc1]
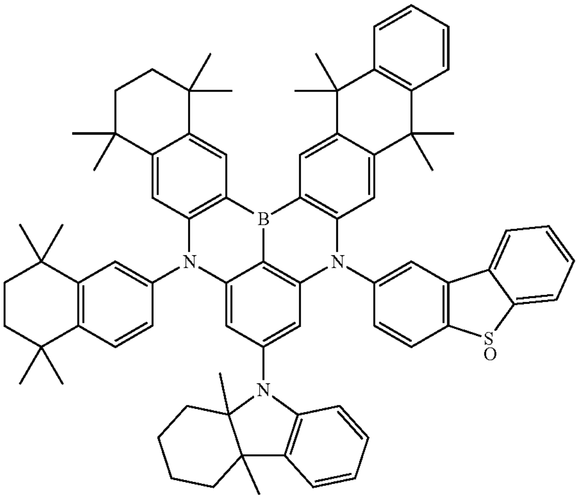
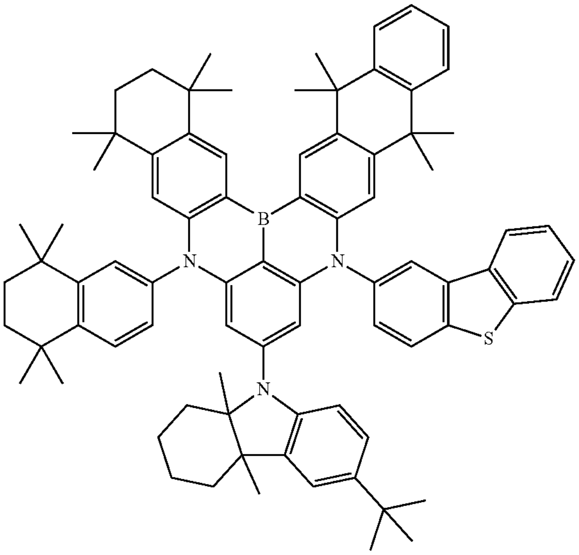

-continued
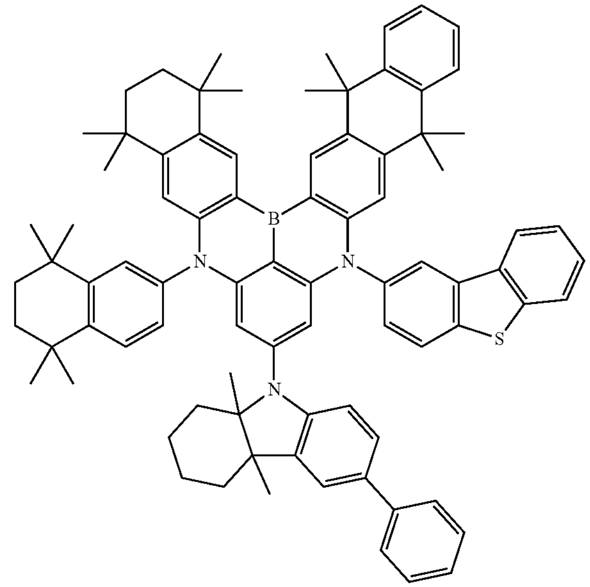
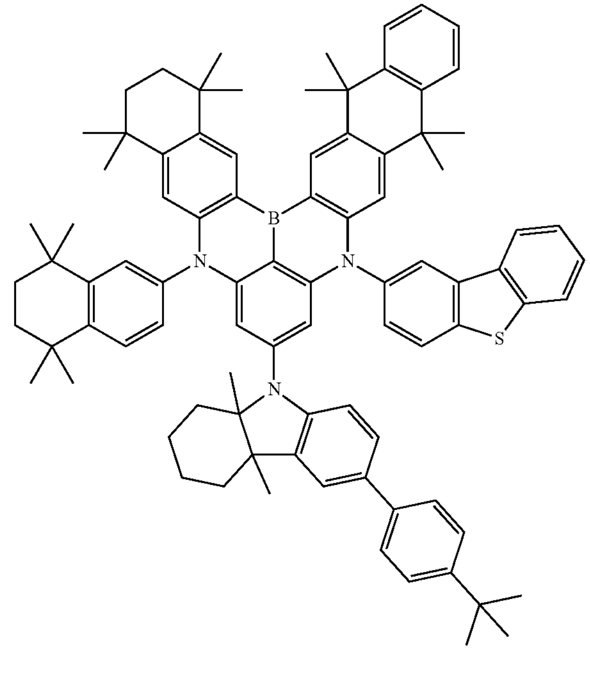
-continued
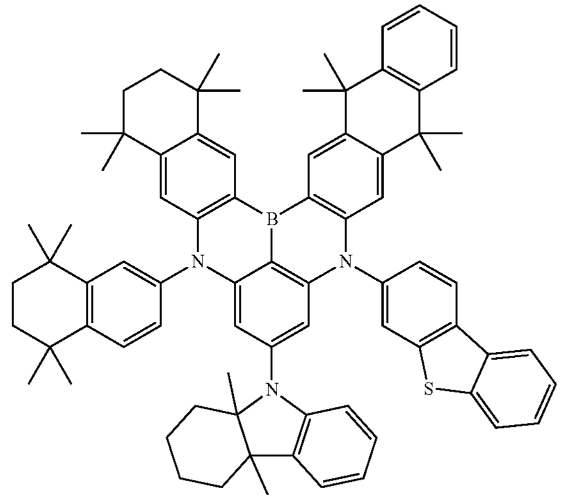
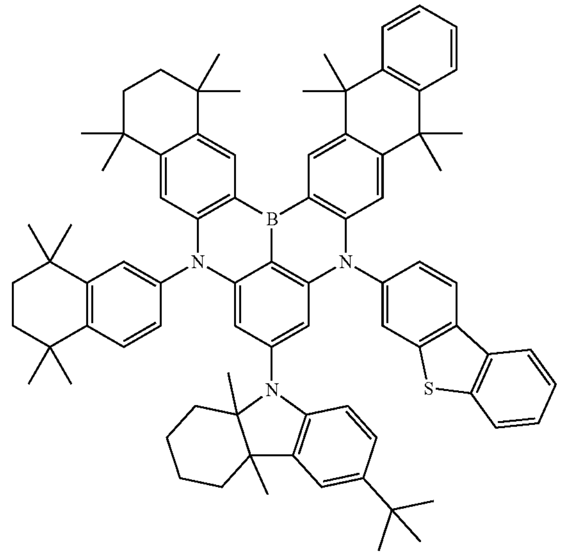
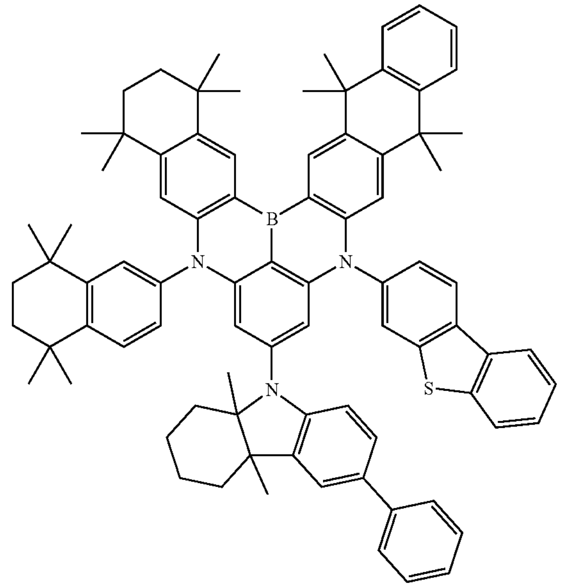

-continued
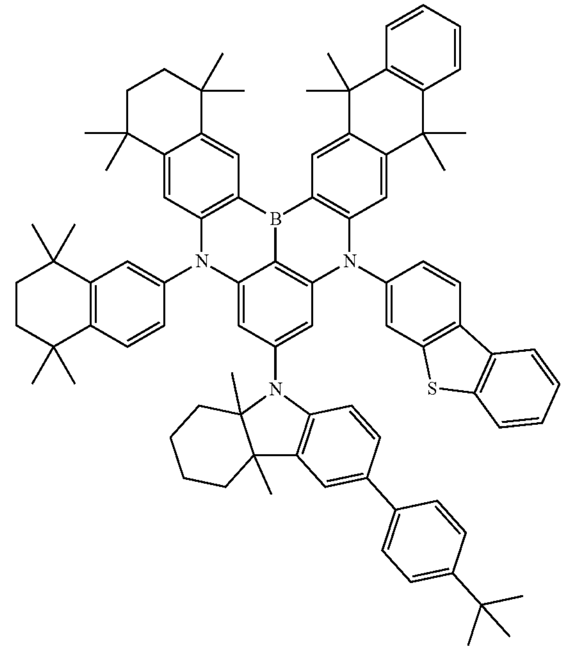 [SMILES: CC(C)(C)c1ccc(-c2ccc3c(c2)C2(C)CCCCC2(C)N3c2cc3c4c(c2)N(c2ccc5c(c2)sc2ccccc25)c2cc5c(cc2B4c2cc4c(cc2N3c2ccc3c(c2)C(C)(C)CCC3(C)C)C(C)(C)CCC4(C)C)C(C)(C)c2ccccc2C5(C)C)cc1]
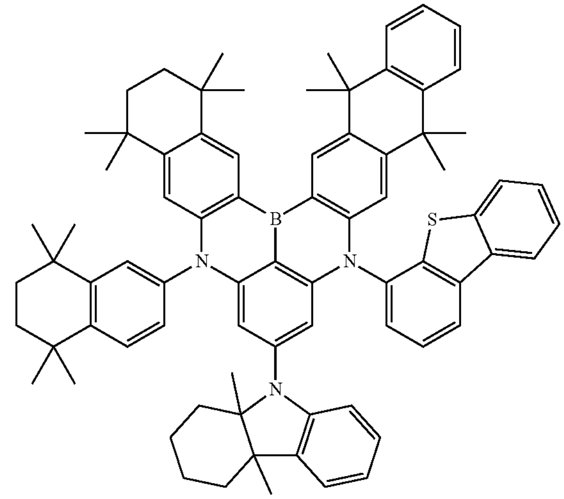
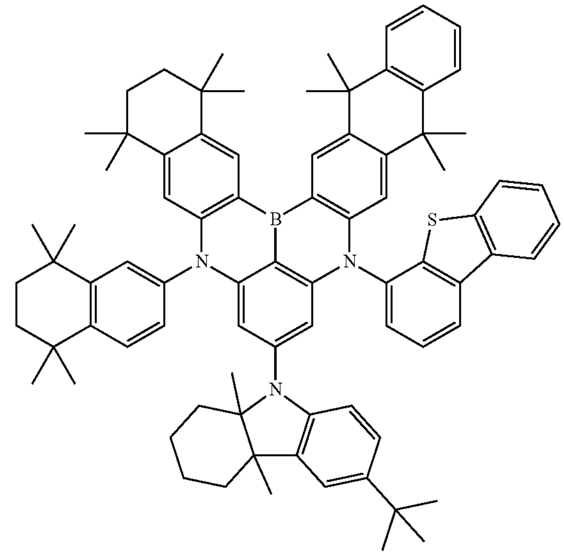
-continued
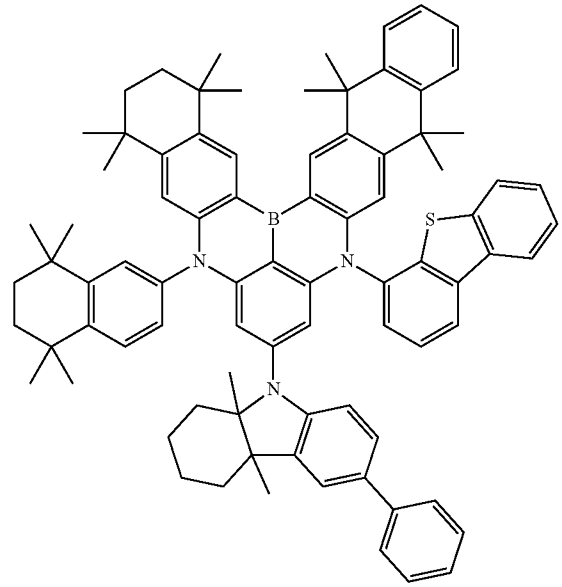
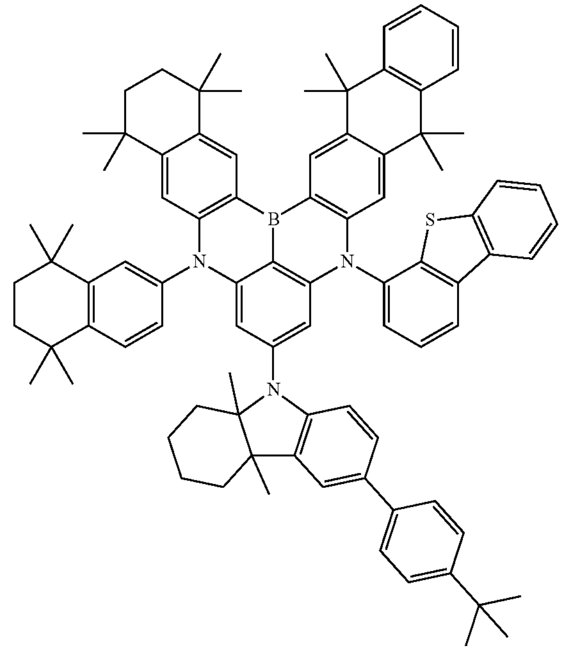 [SMILES: CC(C)(C)c1ccc(-c2ccc3c(c2)C2(C)CCCCC2(C)N3c2cc3c4c(c2)N(c2cccc5c2sc2ccccc25)c2cc5c(cc2B4c2cc4c(cc2N3c2ccc3c(c2)C(C)(C)CCC3(C)C)C(C)(C)CCC4(C)C)C(C)(C)c2ccccc2C5(C)C)cc1]

-continued
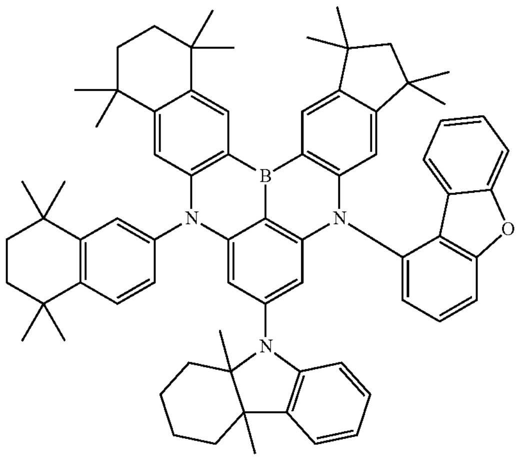
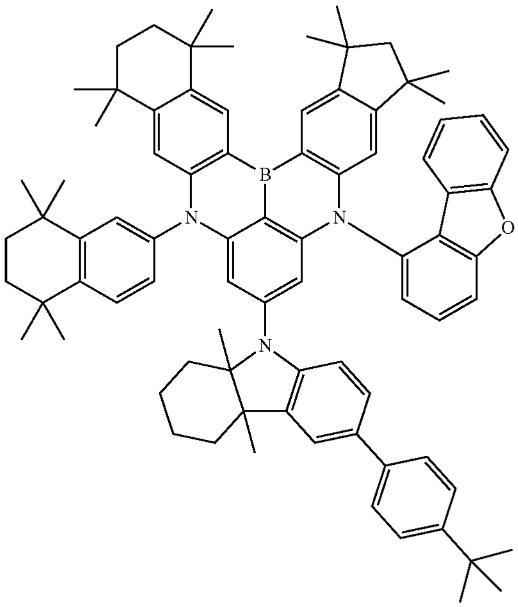
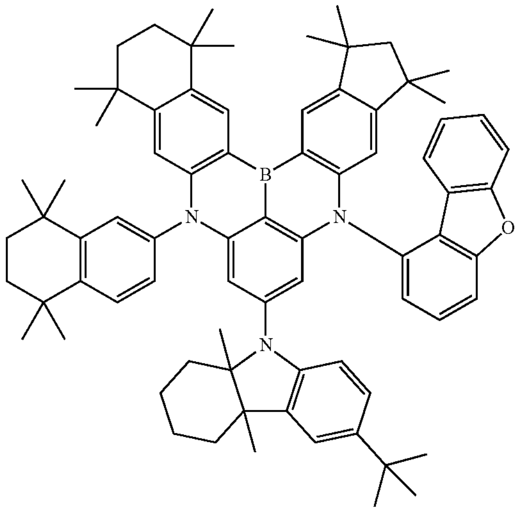
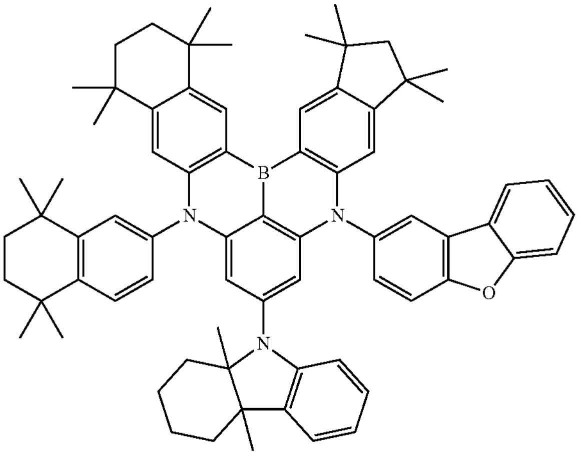
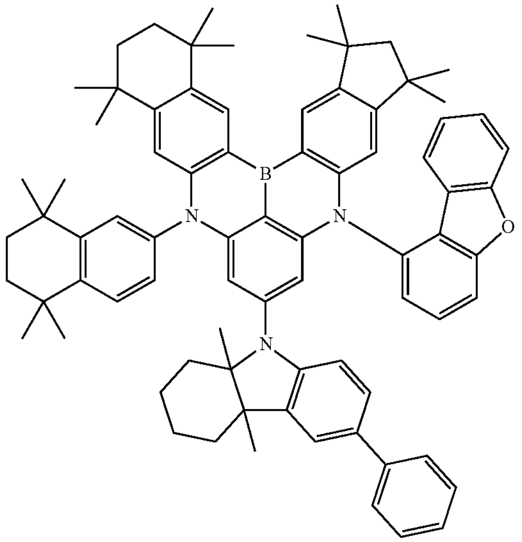
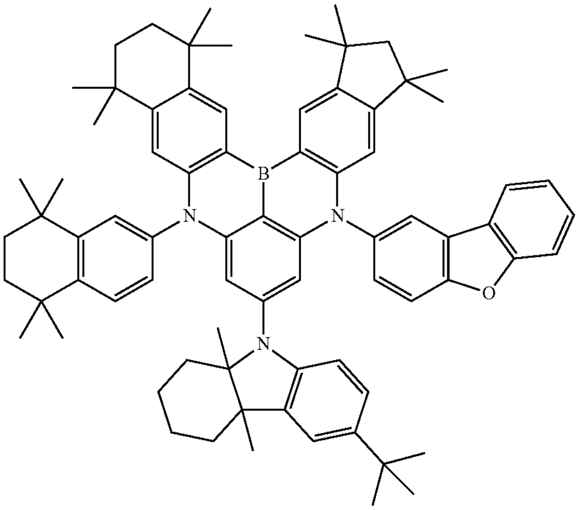

-continued
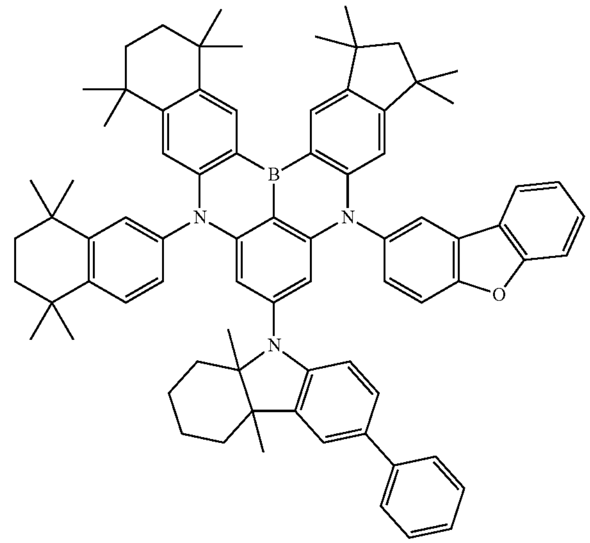
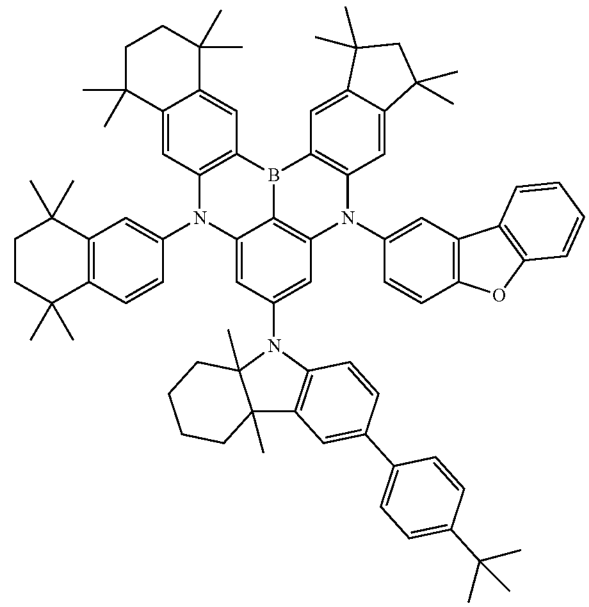
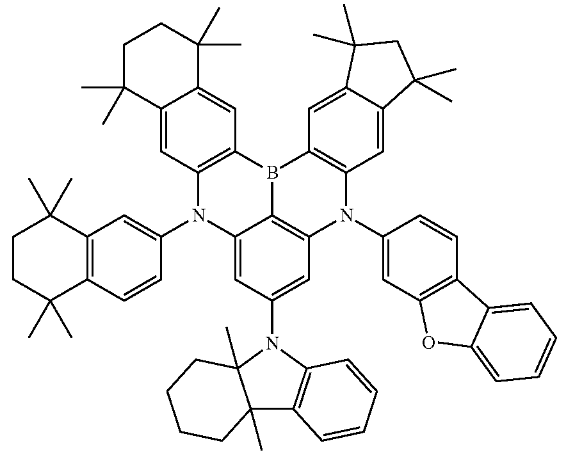
-continued
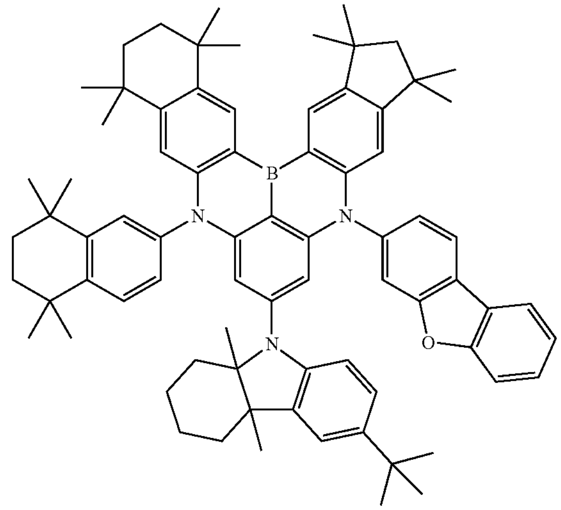
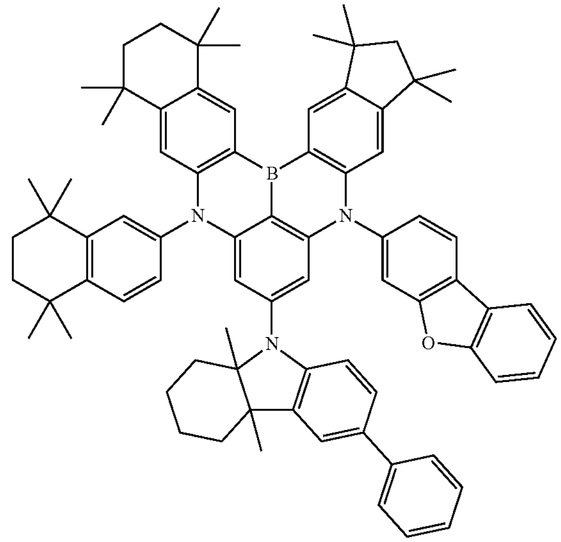
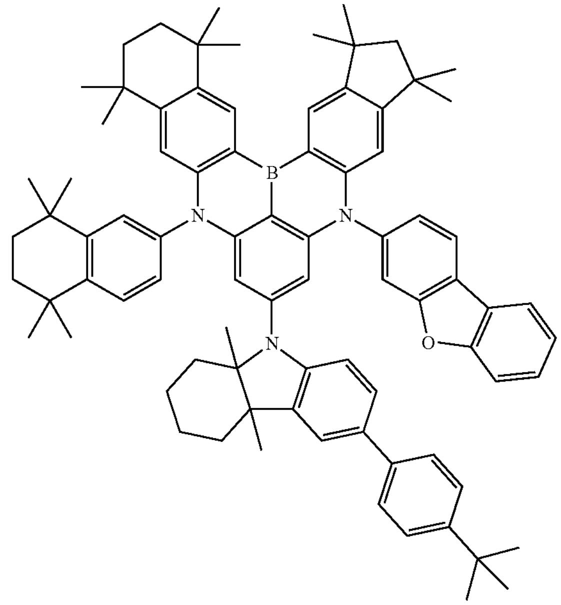

-continued
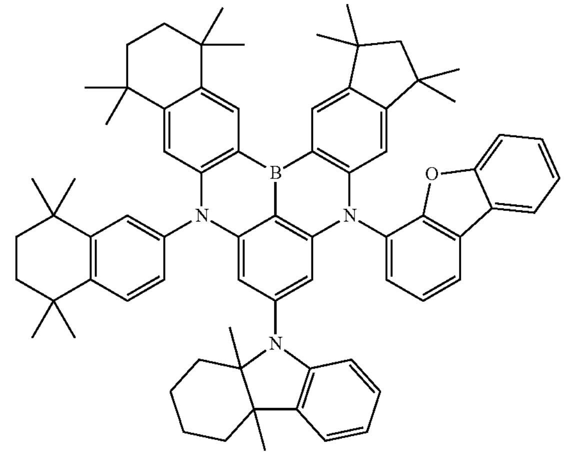
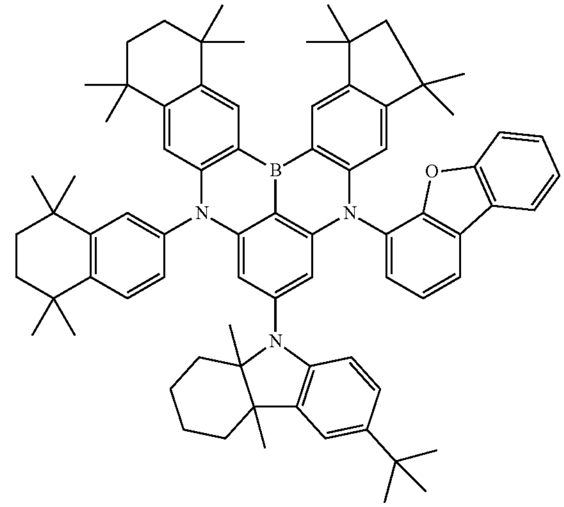
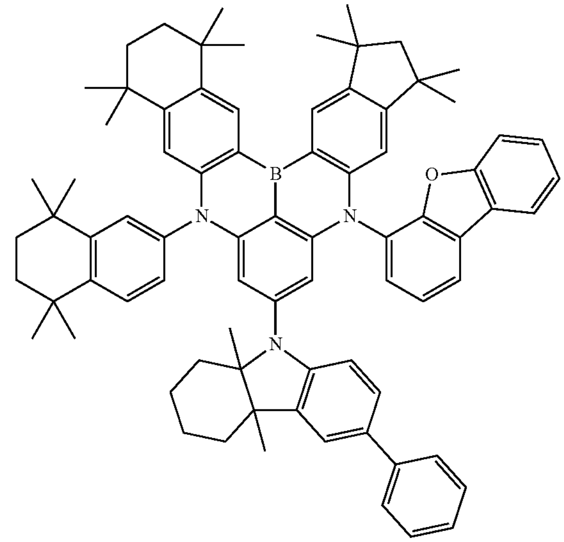
-continued
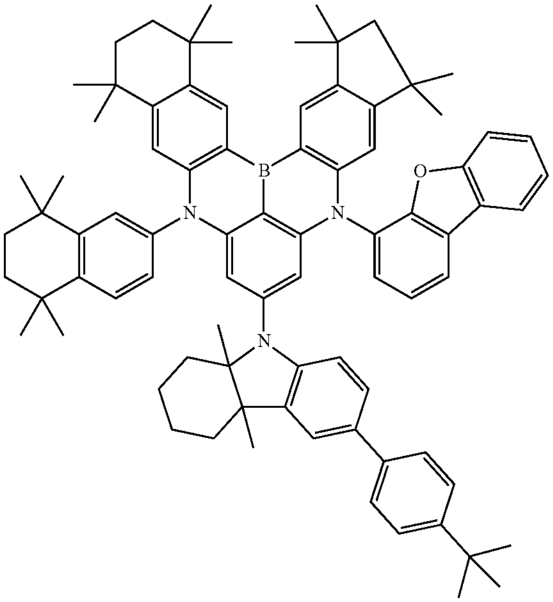
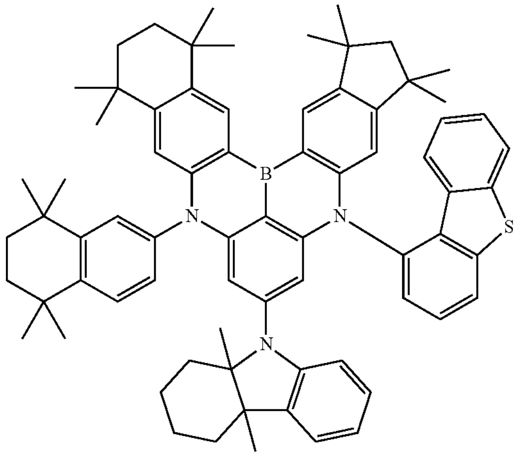
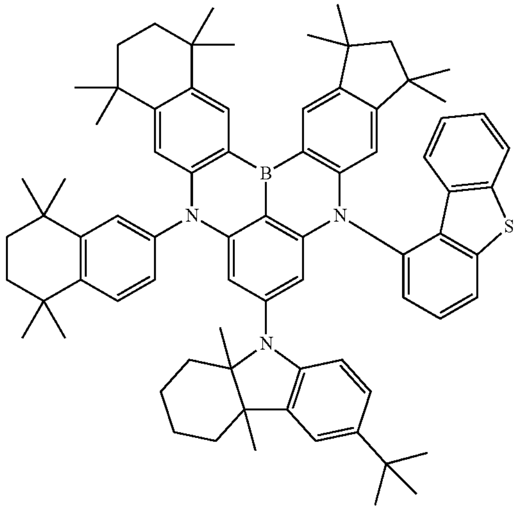

-continued
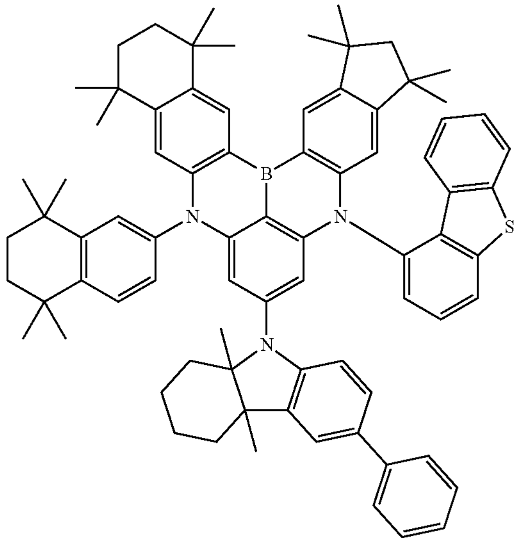
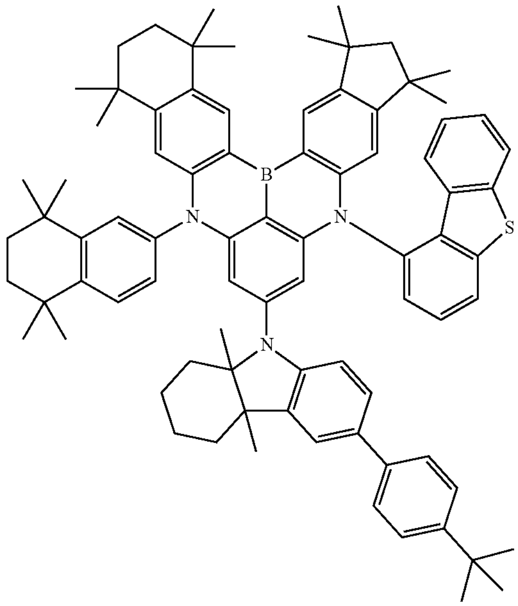
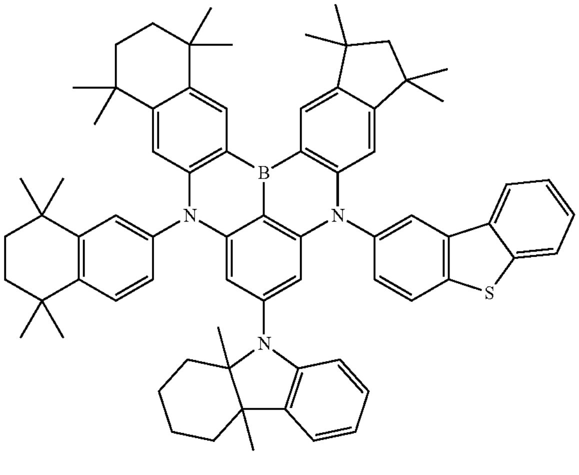
-continued
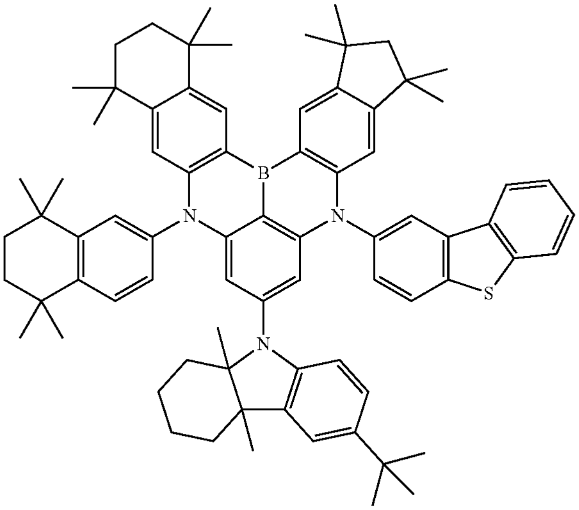
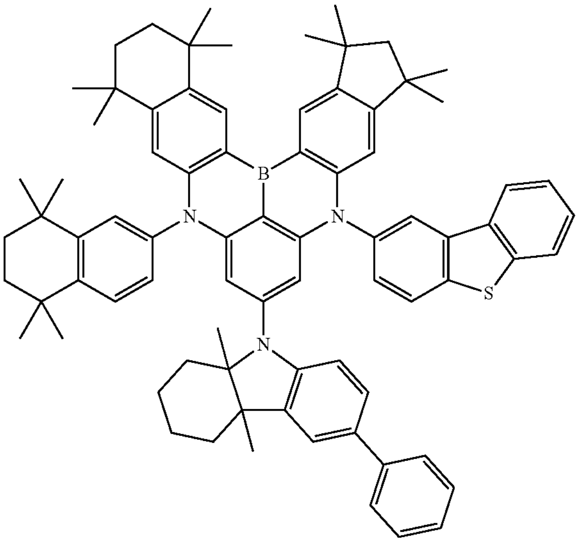
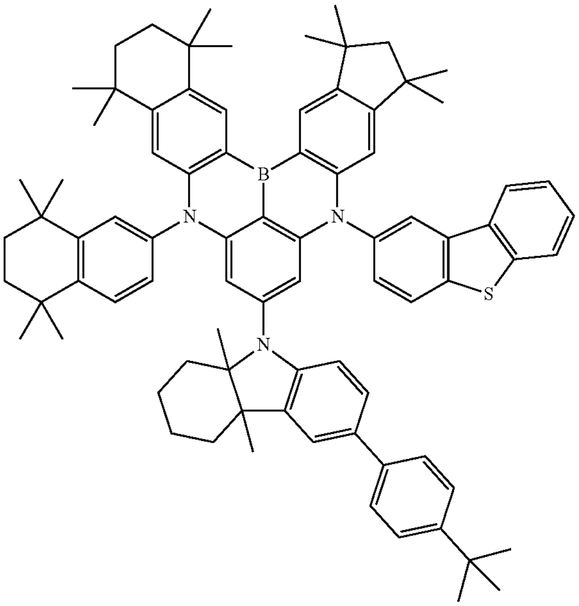

-continued
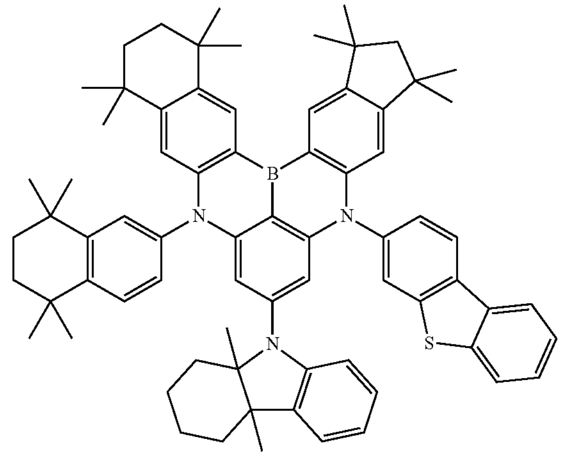
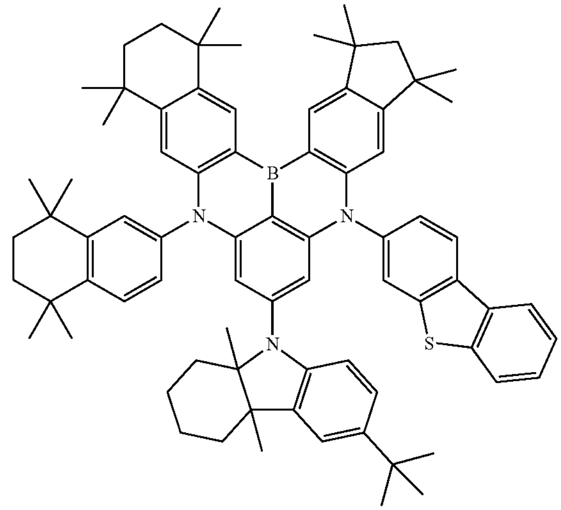
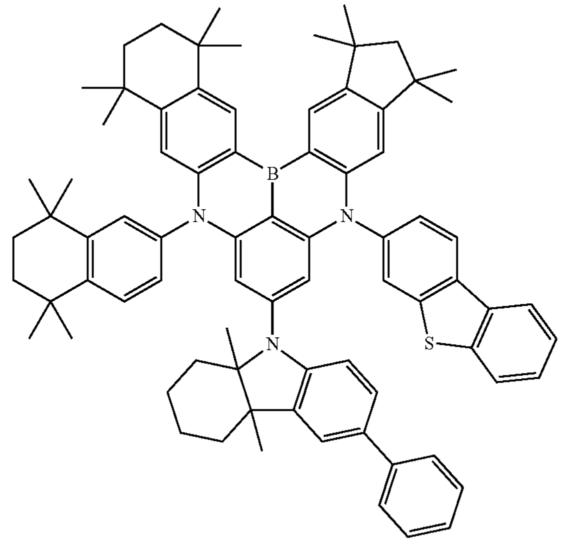
-continued
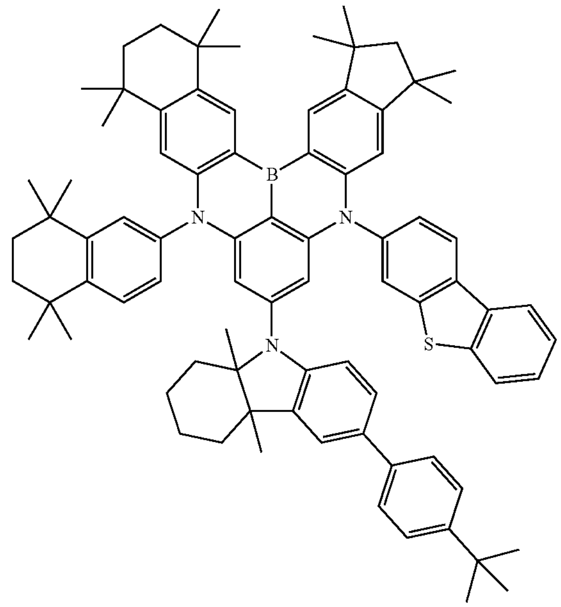
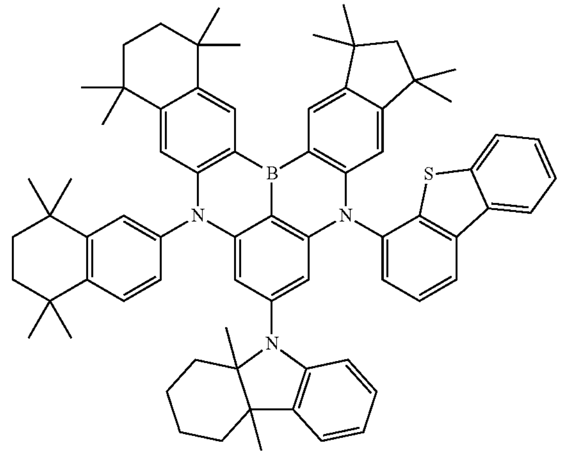
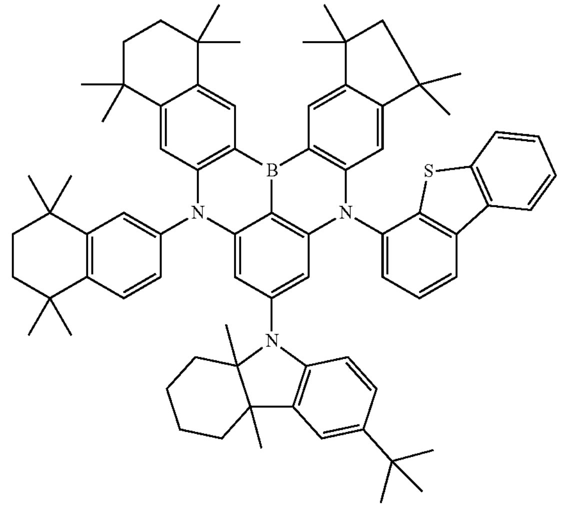

-continued
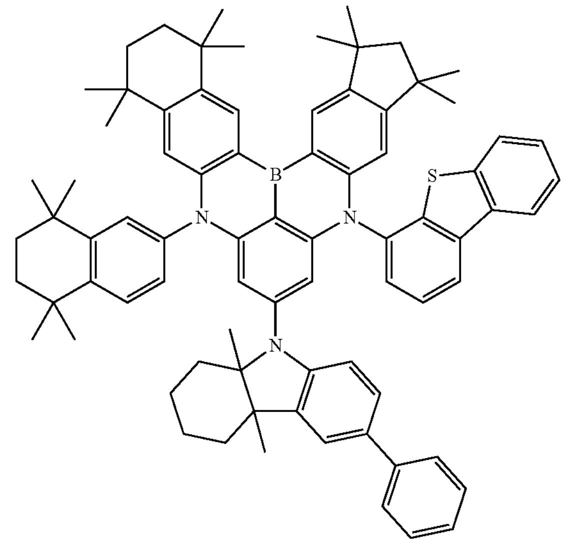
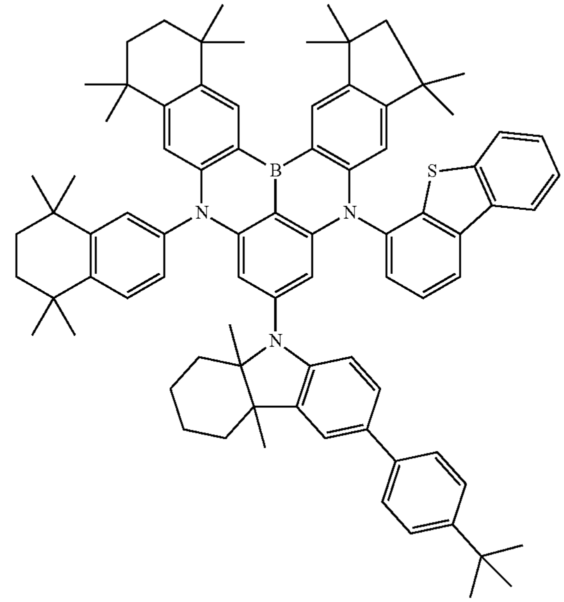 [SMILES: CC(C)(C)c1ccc(-c2ccc3c(c2)C2(C)CCCCC2(C)N3c2cc3c4c(c2)N(c2cccc5c2sc2ccccc25)c2cc5c(cc2B4c2cc4c(cc2N3c2ccc3c(c2)C(C)(C)CCC3(C)C)C(C)(C)CCC4(C)C)C(C)(C)CC5(C)C)cc1]
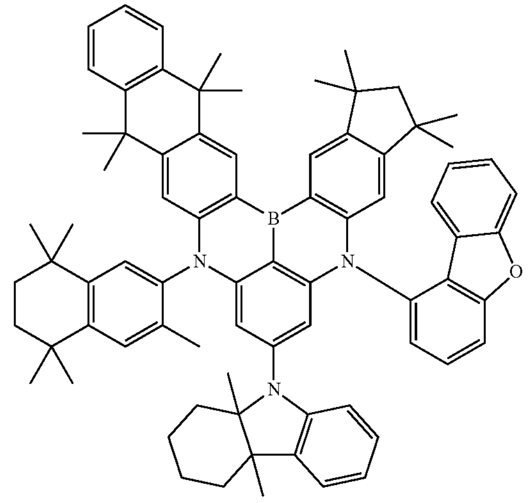
-continued
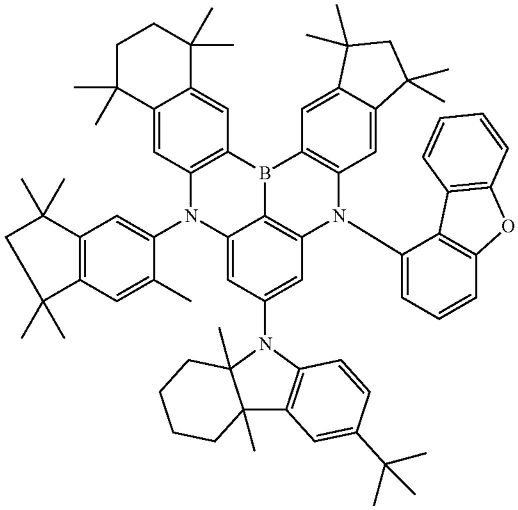
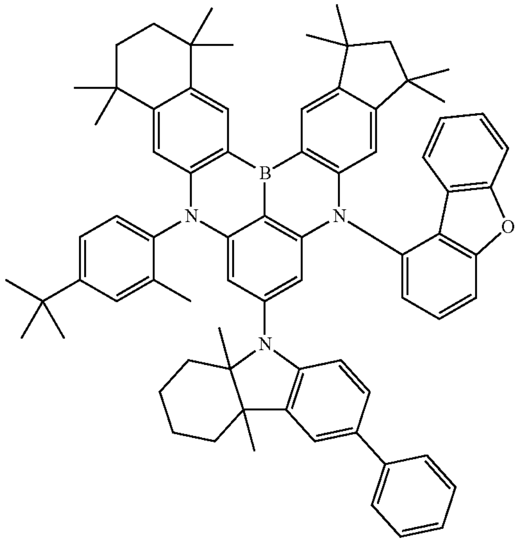
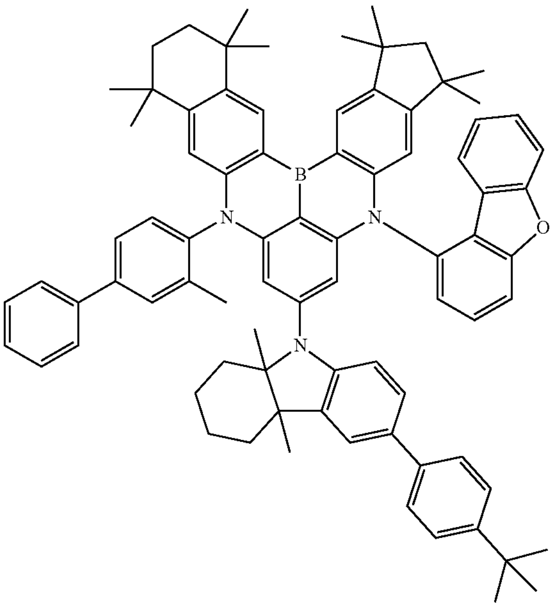

-continued
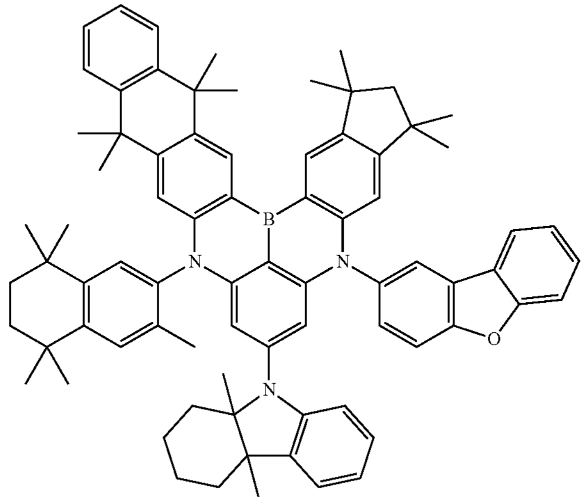
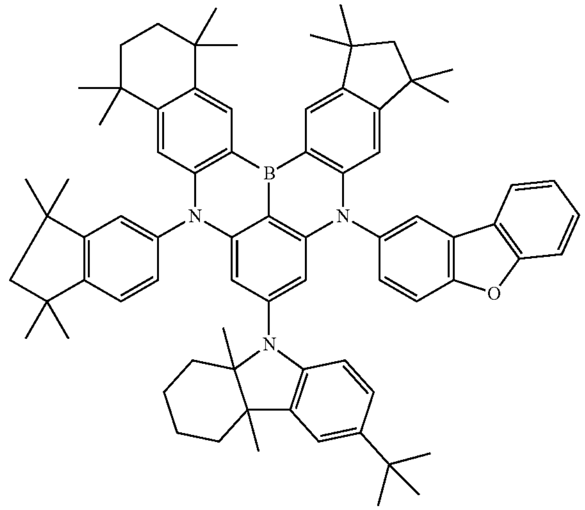
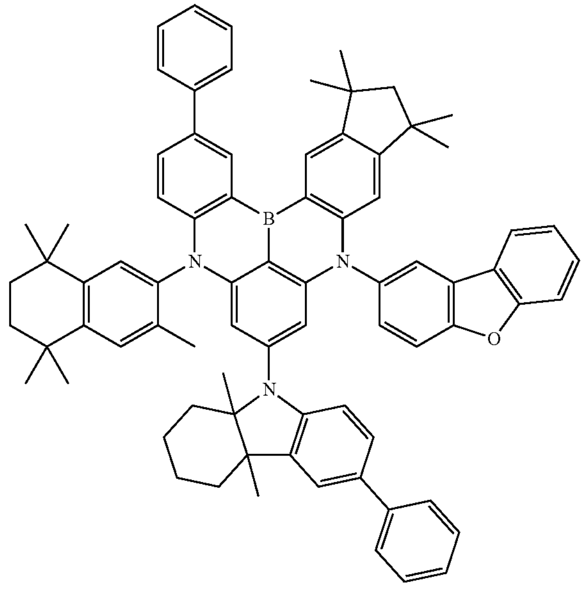
-continued
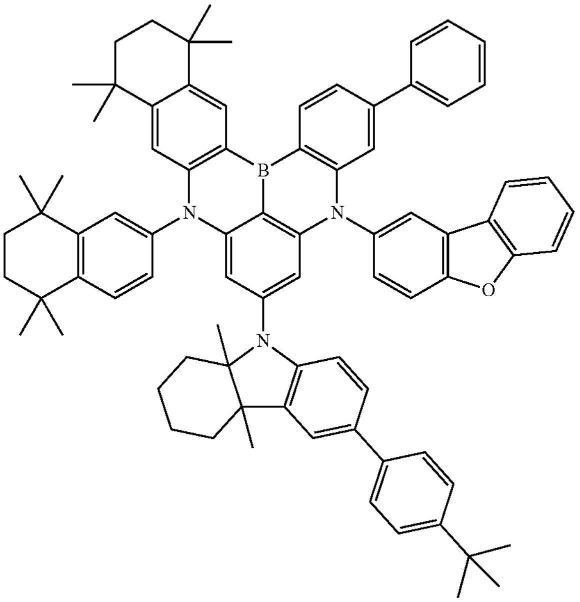
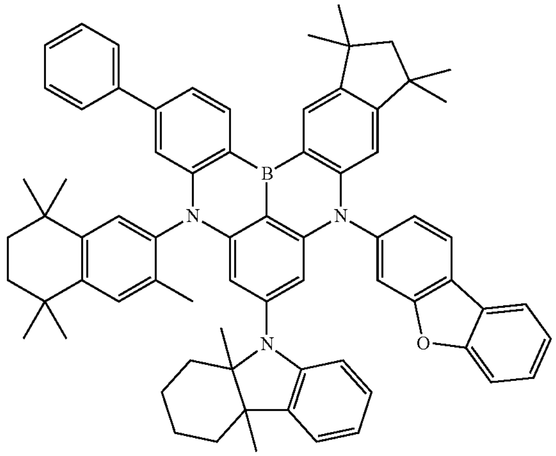
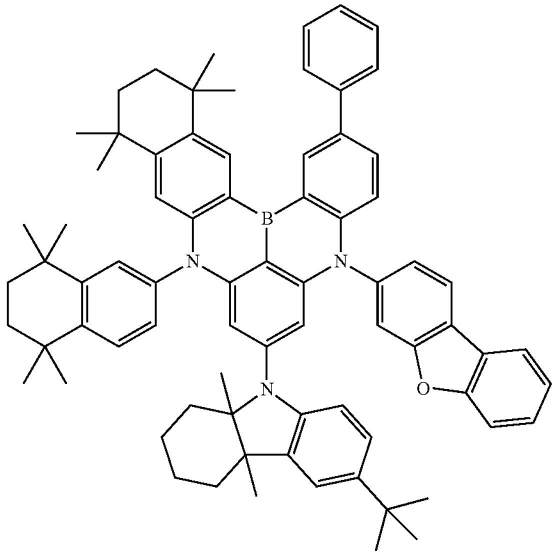

-continued
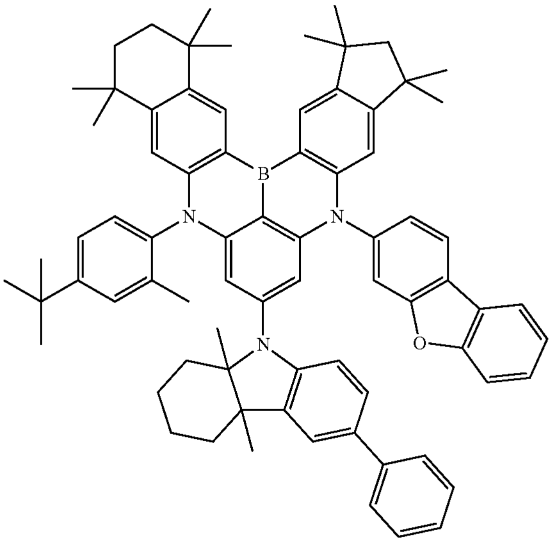
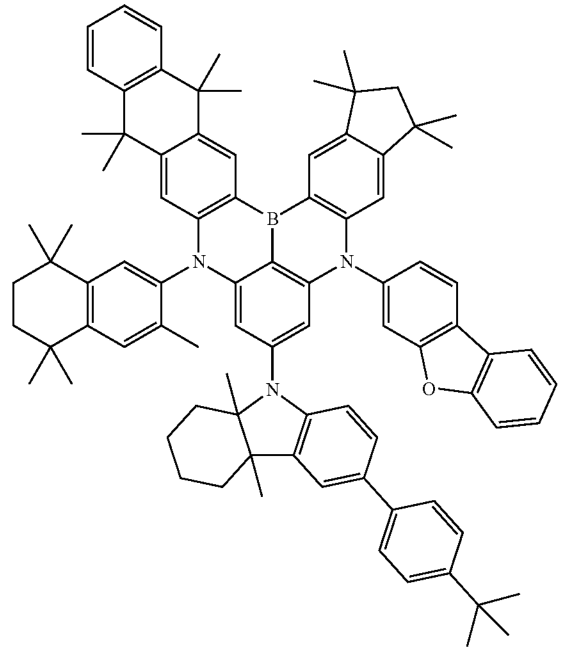
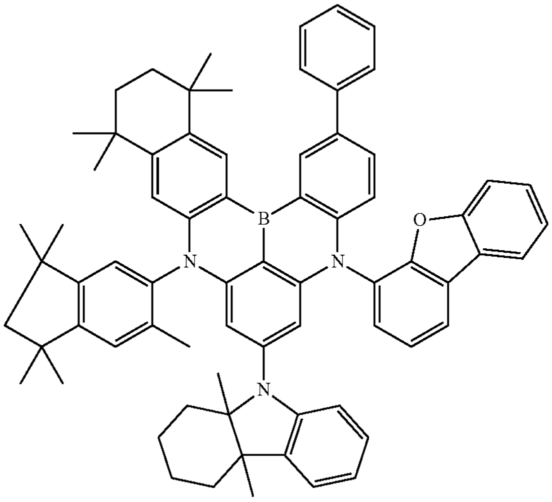
-continued
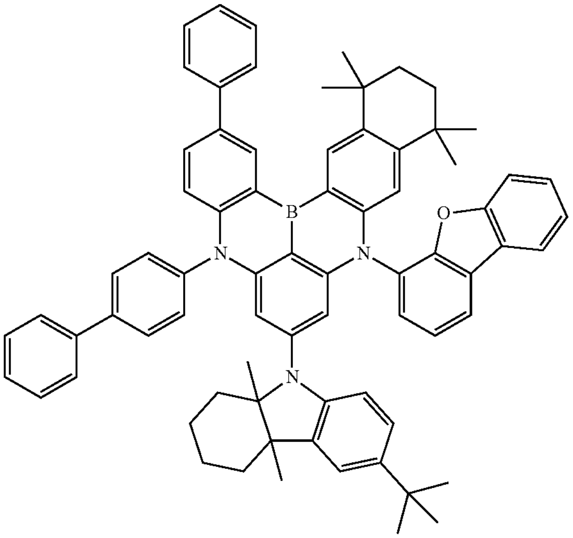
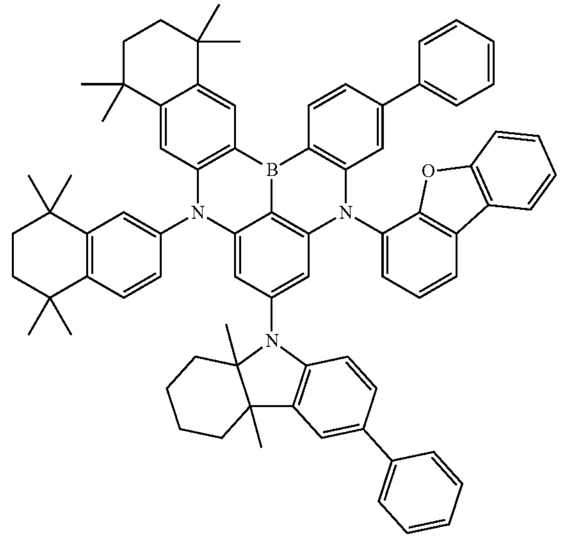
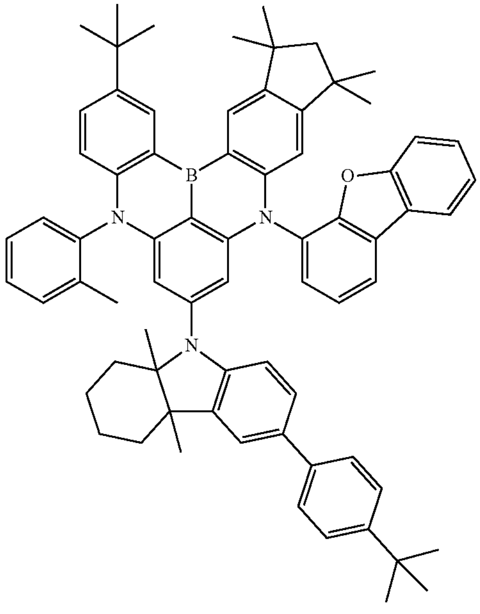 [SMILES: Cc1ccccc1N1c2ccc(C(C)(C)C)cc2B2c3cc4c(cc3N(c3cccc5c3oc3ccccc35)c3cc(N5c6ccc(-c7ccc(C(C)(C)C)cc7)cc6C6(C)CCCCC56C)cc1c32)C(C)(C)CC4(C)C]

-continued
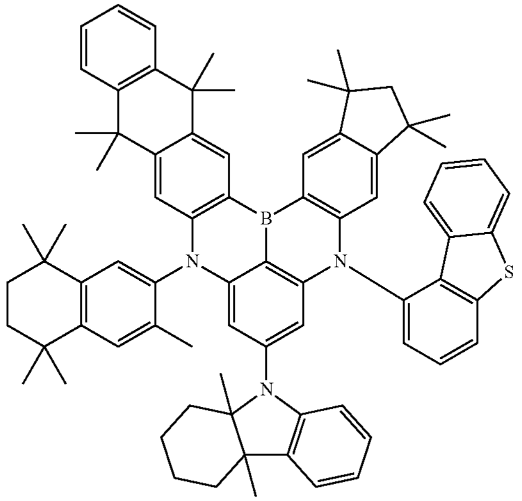
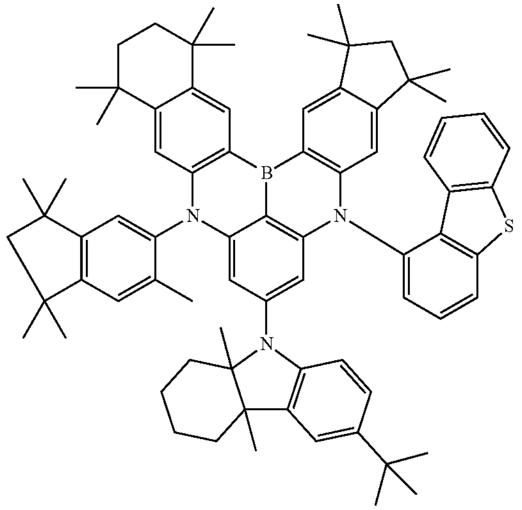
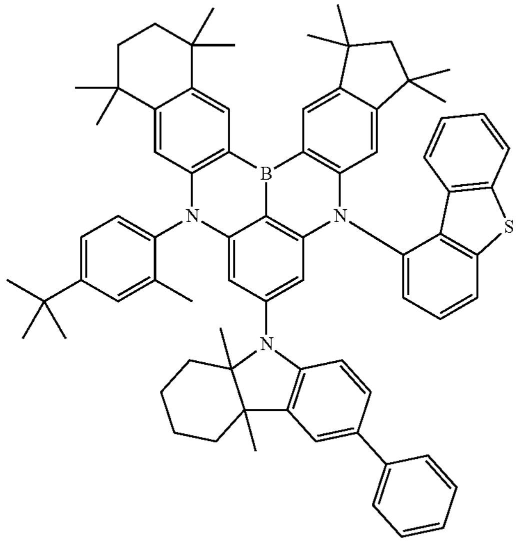
-continued
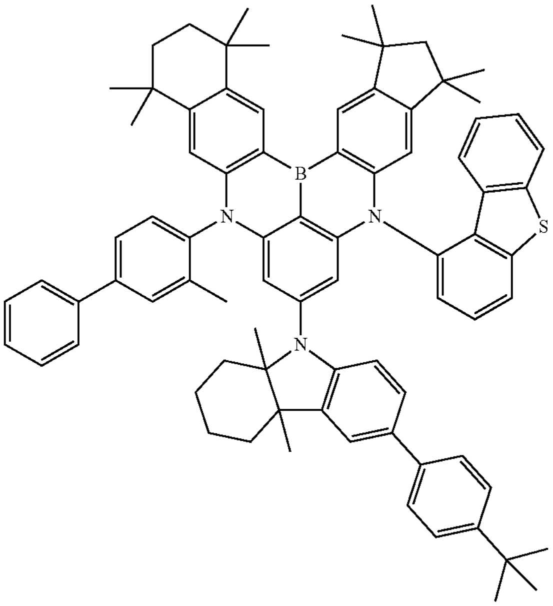
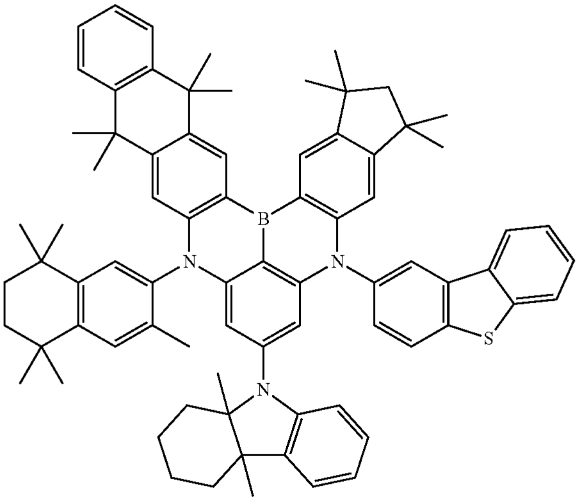
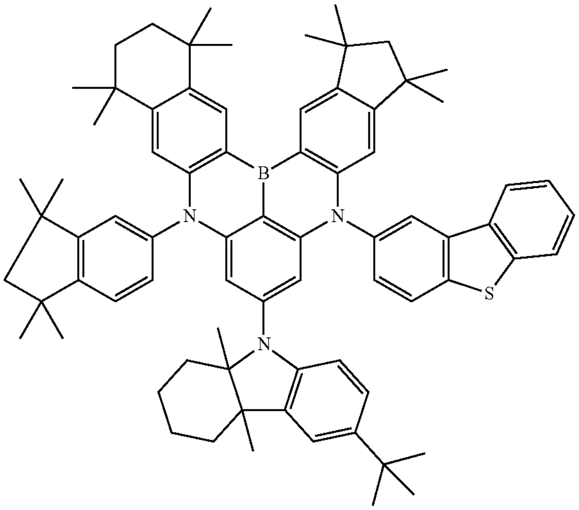

-continued
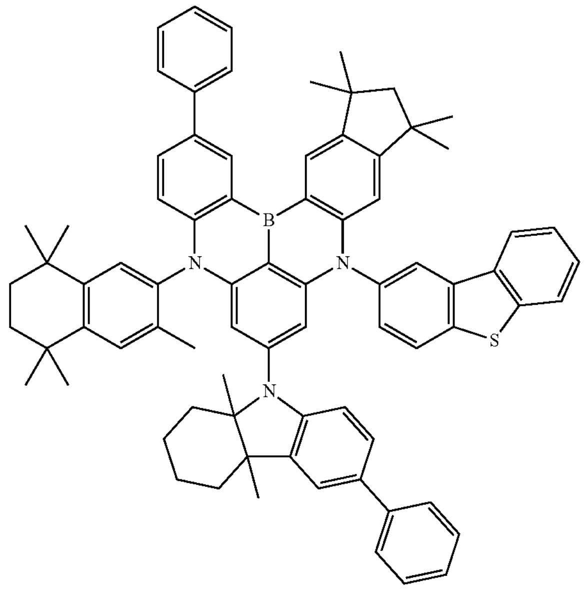
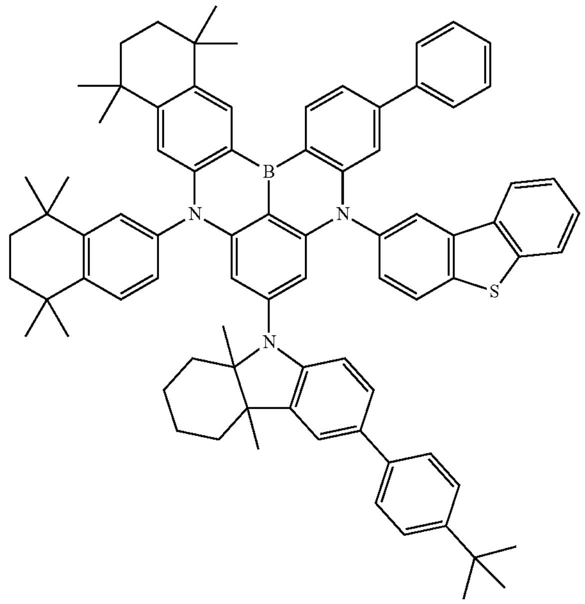
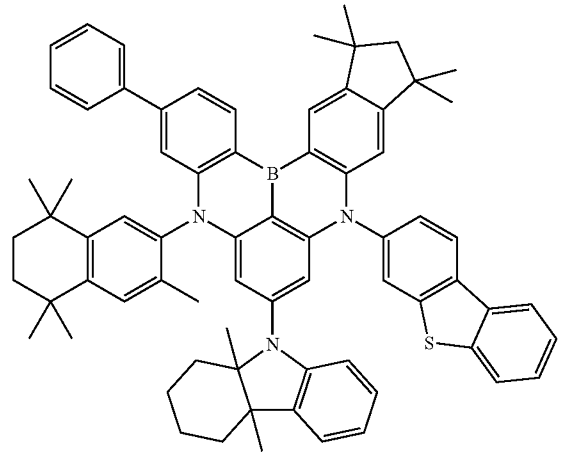
-continued
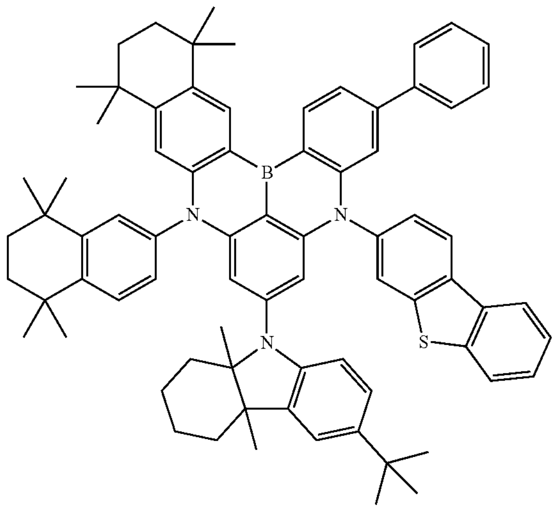
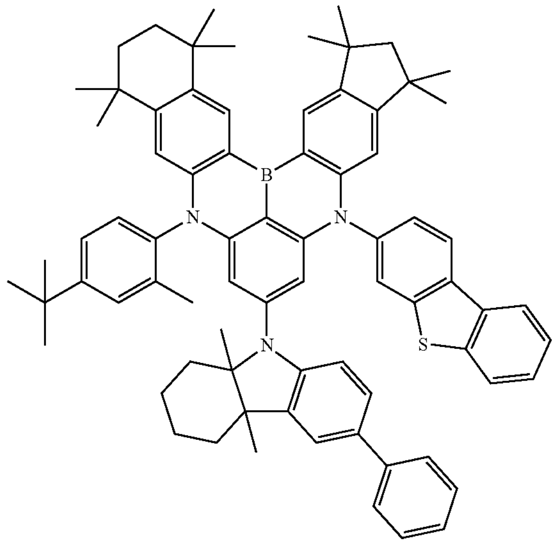
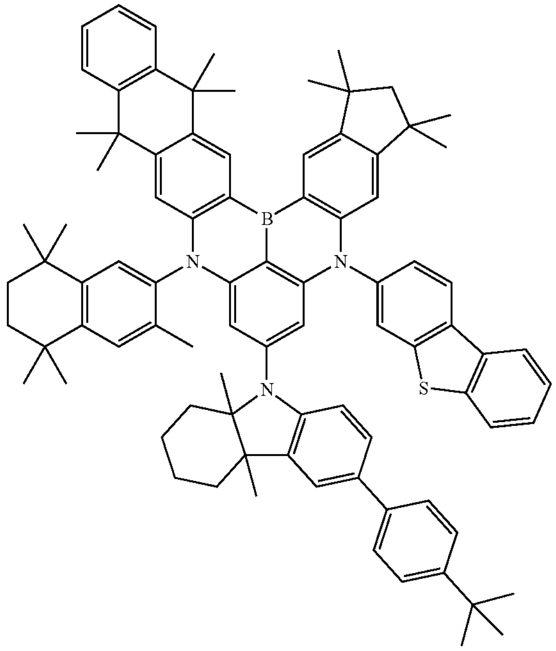

-continued
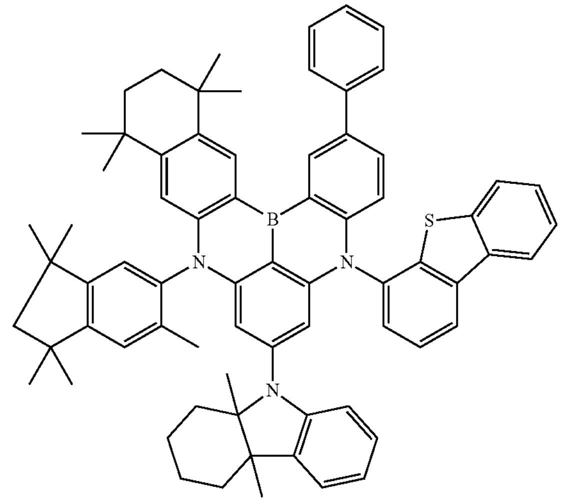
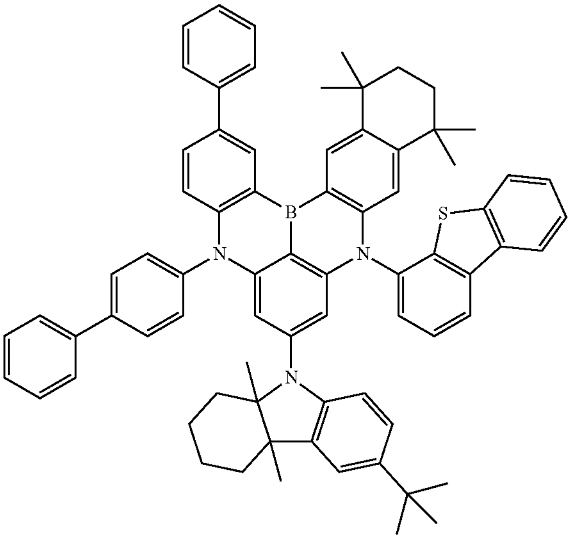
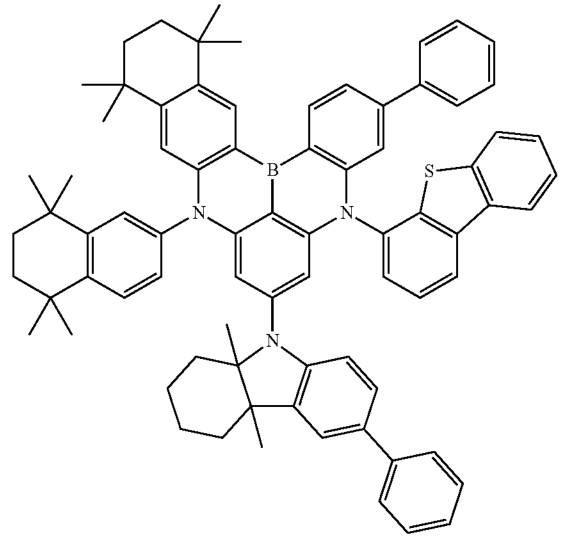
-continued
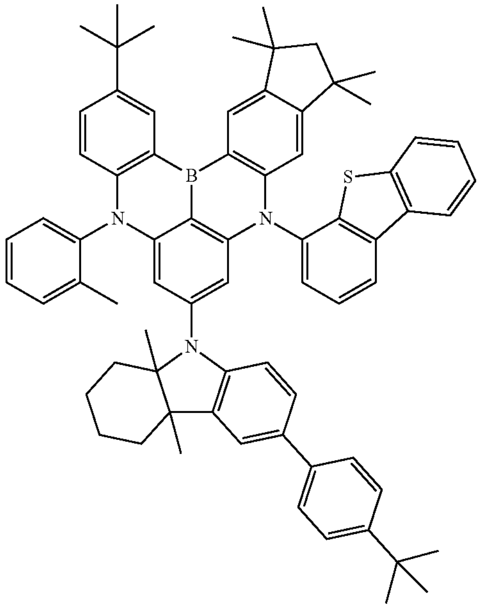 [SMILES: Cc1ccccc1N1c2ccc(C(C)(C)C)cc2B2c3cc4c(cc3N(c3cccc5c3sc3ccccc35)c3cc(N5c6ccc(-c7ccc(C(C)(C)C)cc7)cc6C6(C)CCCCC56C)cc1c32)C(C)(C)CC4(C)C]
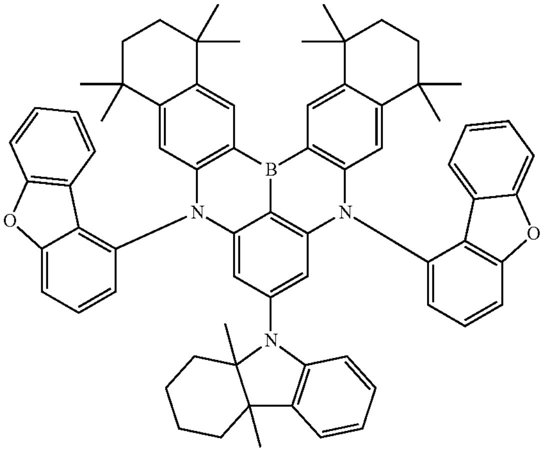
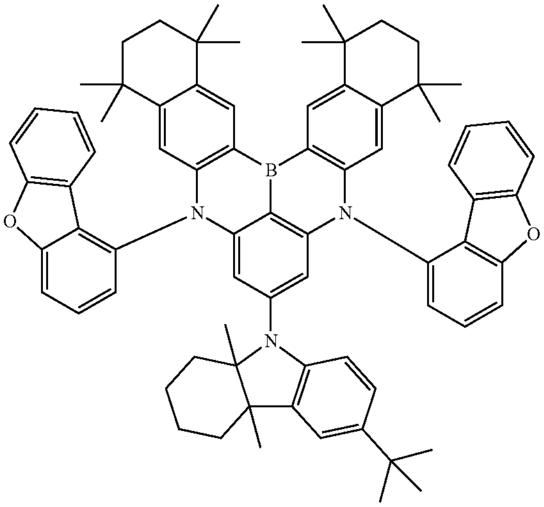

-continued
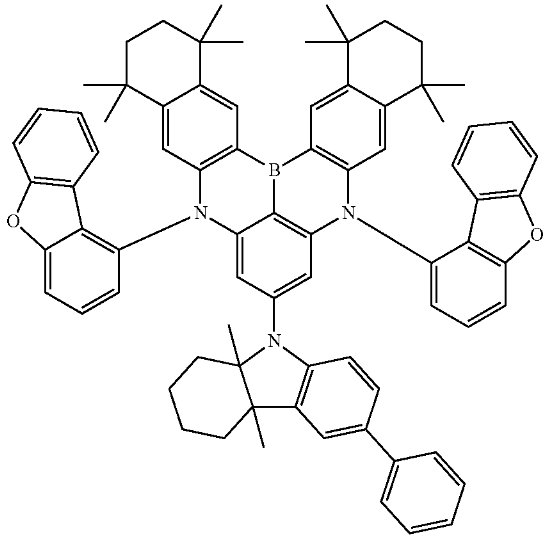
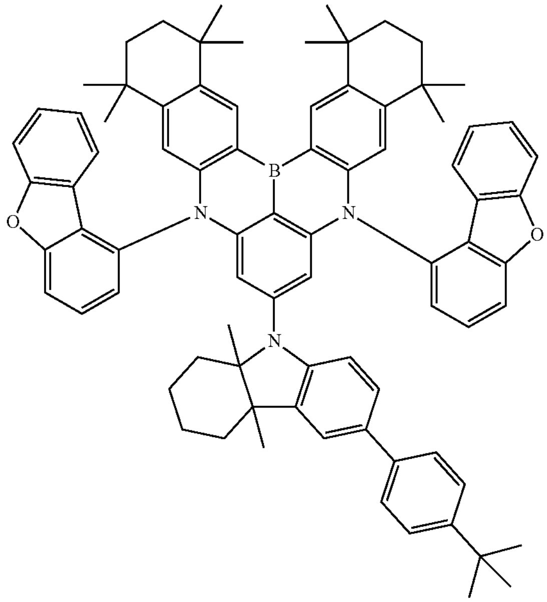
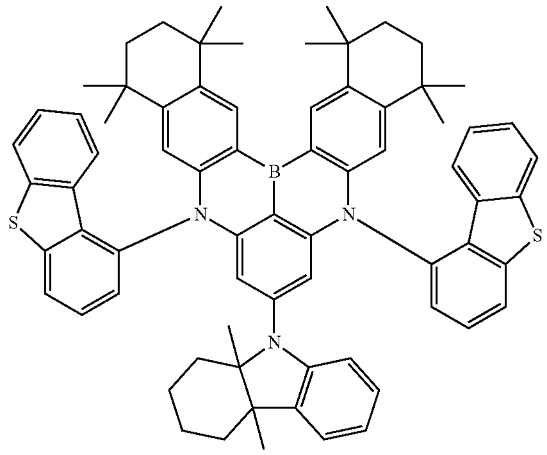
-continued
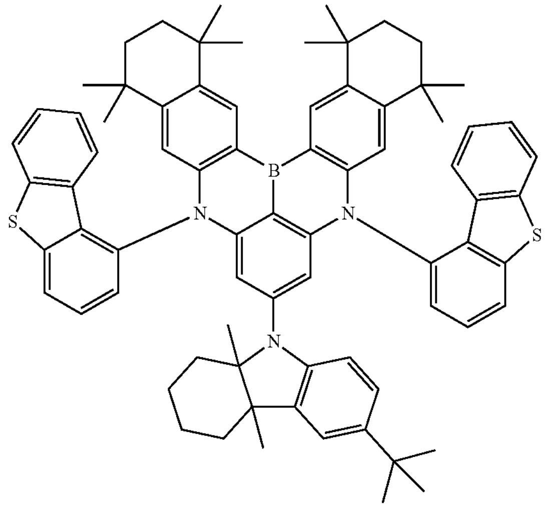
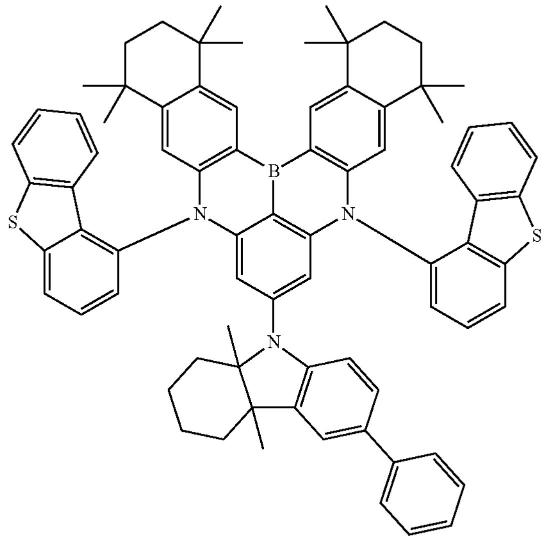
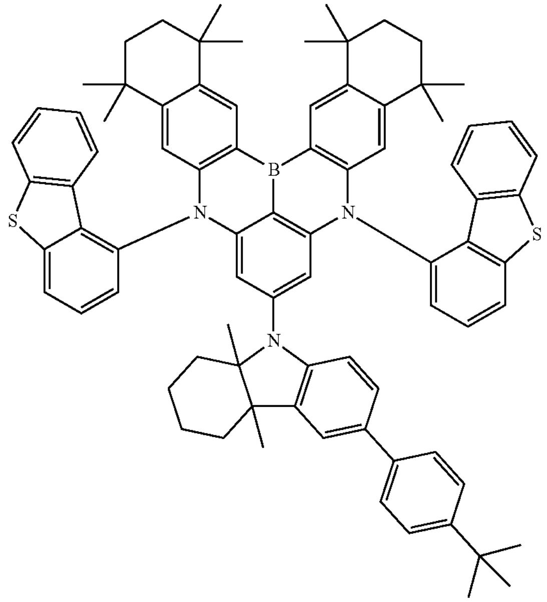

-continued
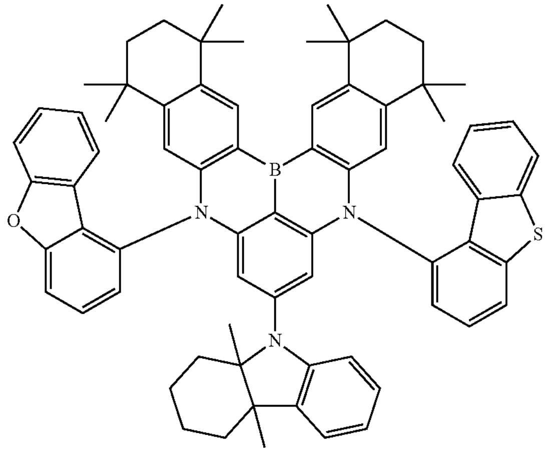
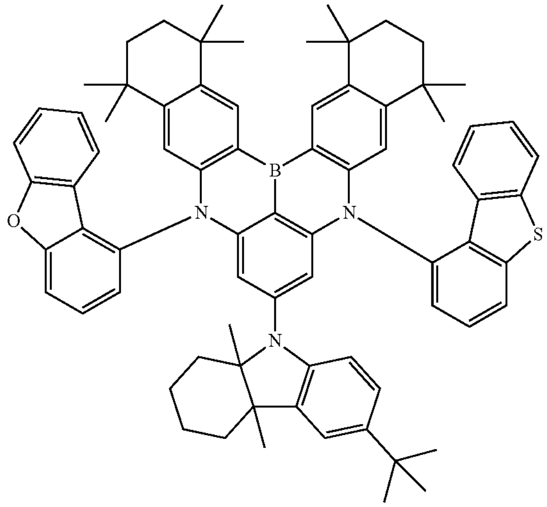
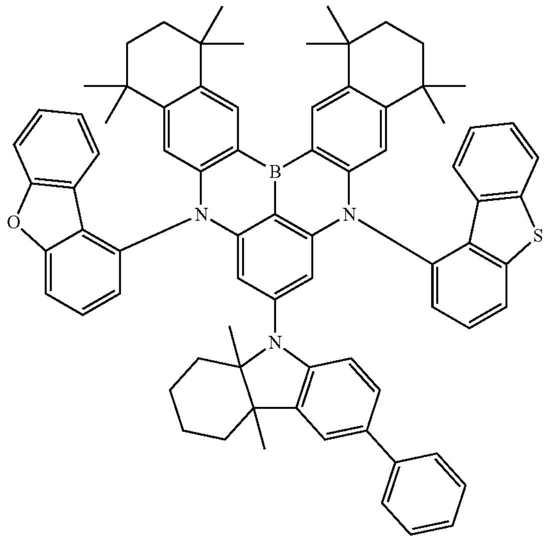
-continued
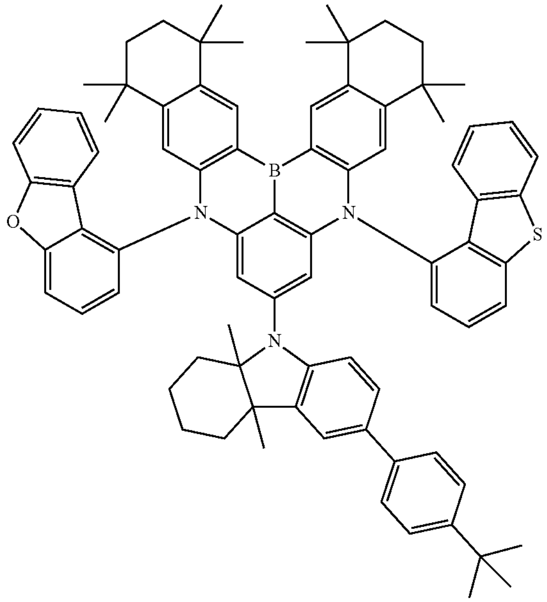
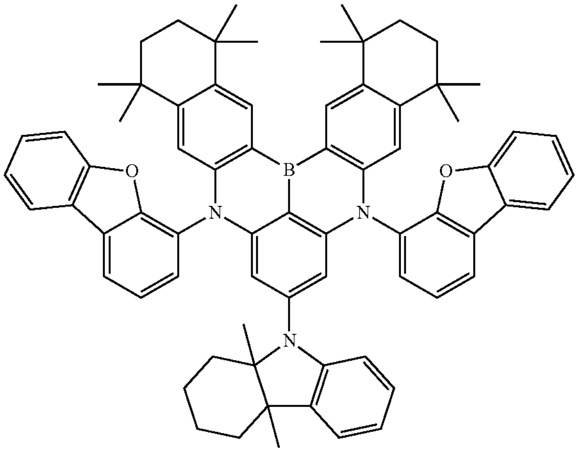
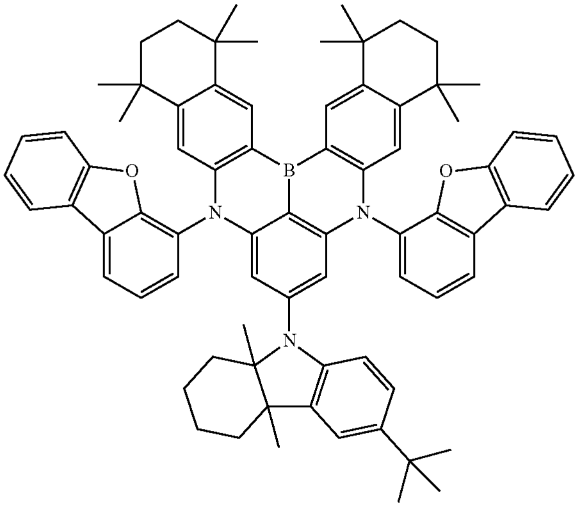

-continued
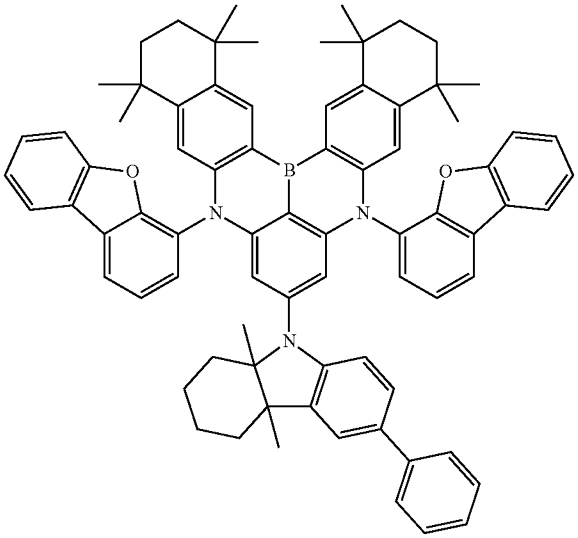
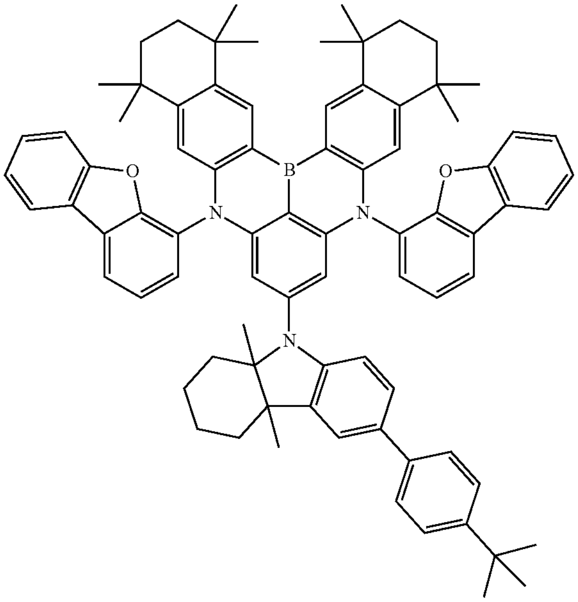
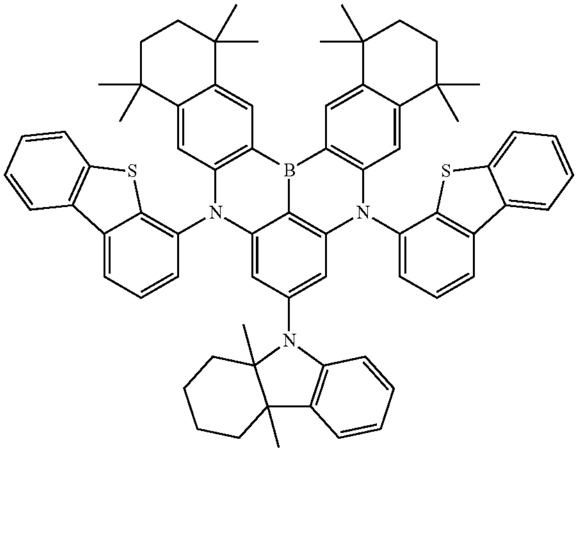
-continued
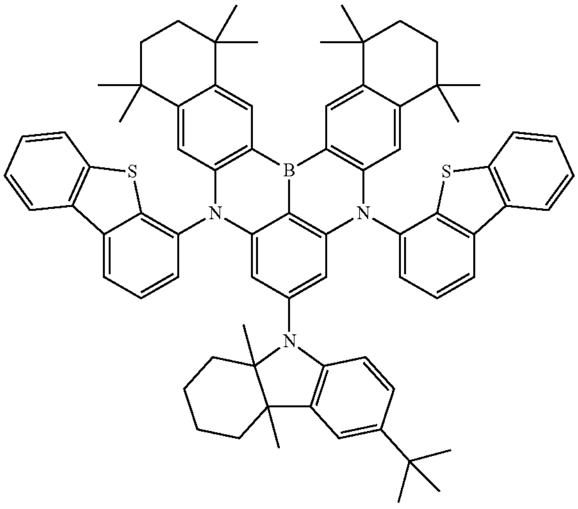
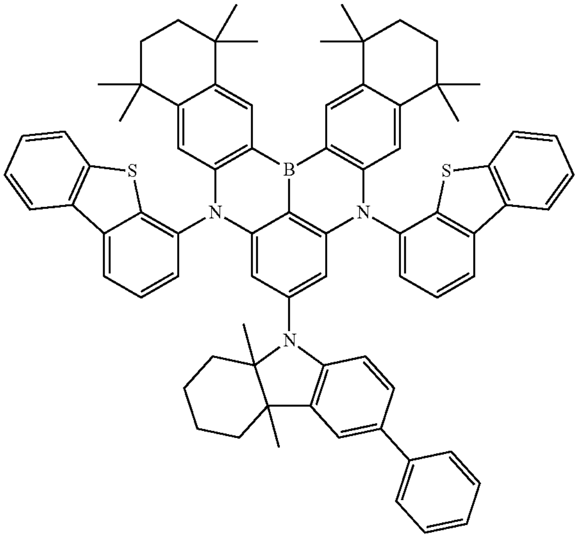
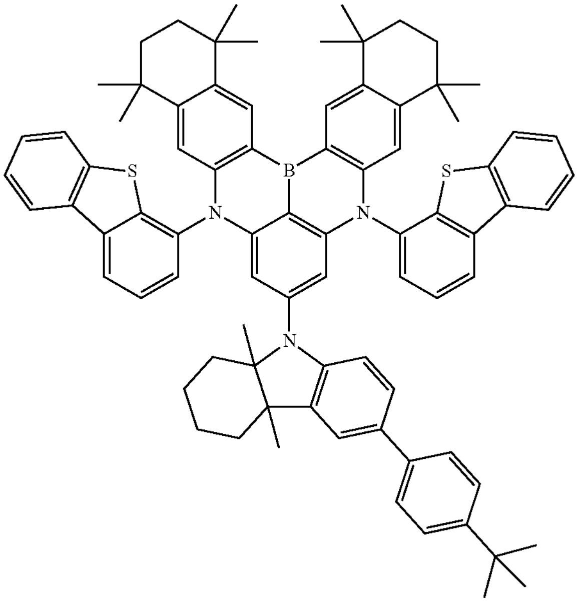 [SMILES: CC(C)(C)c1ccc(-c2ccc3c(c2)C2(C)CCCCC2(C)N3c2cc3c4c(c2)N(c2cccc5c2oc2ccccc25)c2cc5c(cc2B4c2cc4c(cc2N3c2cccc3c2oc2ccccc23)C(C)(C)CCC4(C)C)C(C)(C)CCC5(C)C)cc1]

-continued
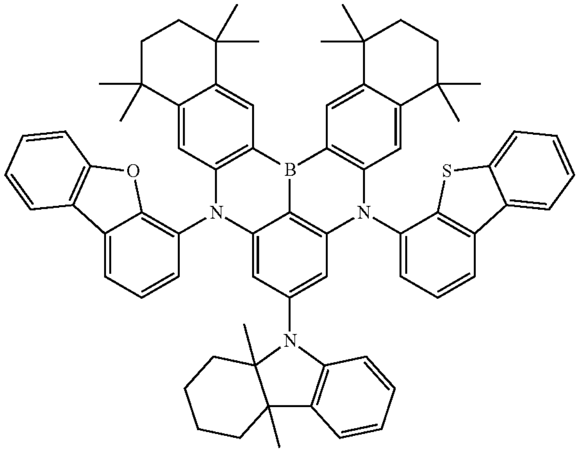
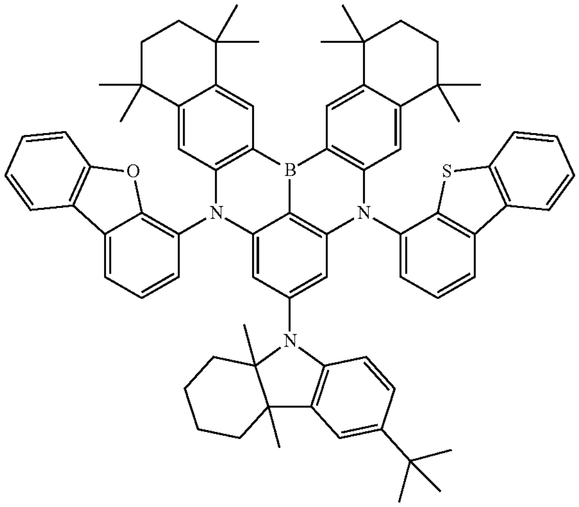
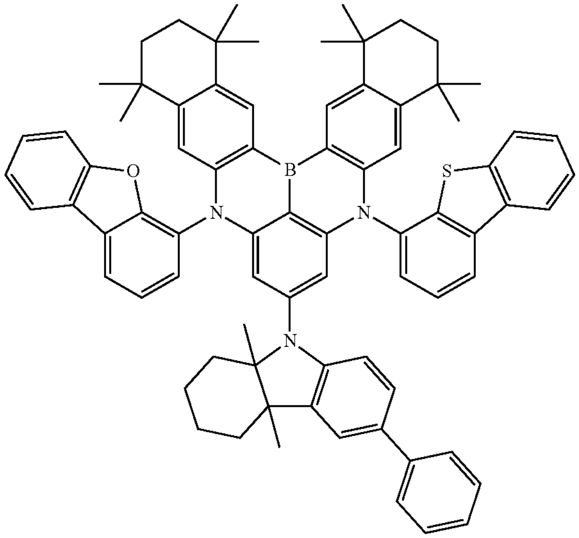
-continued
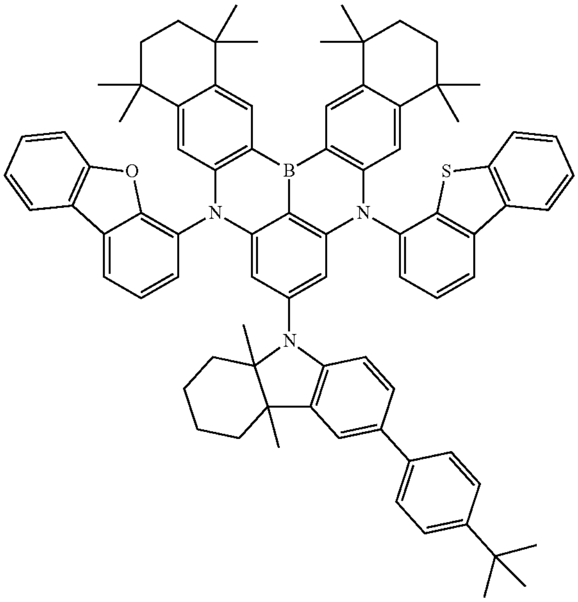
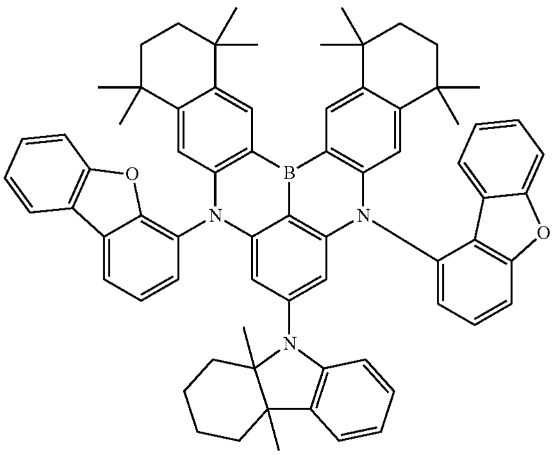
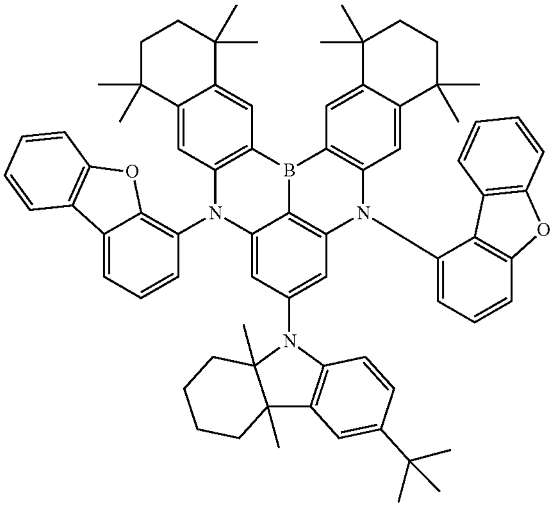

-continued
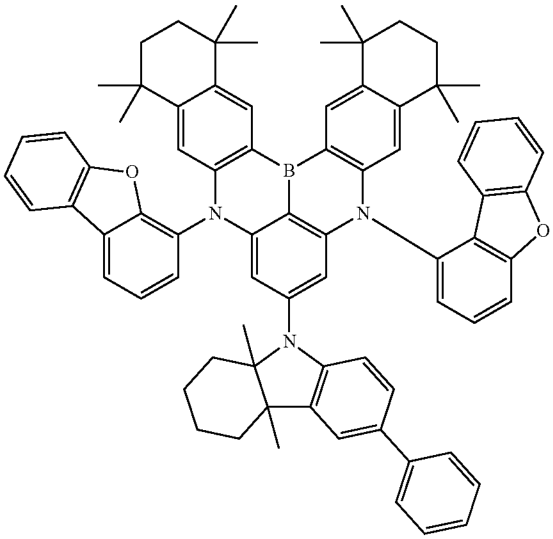
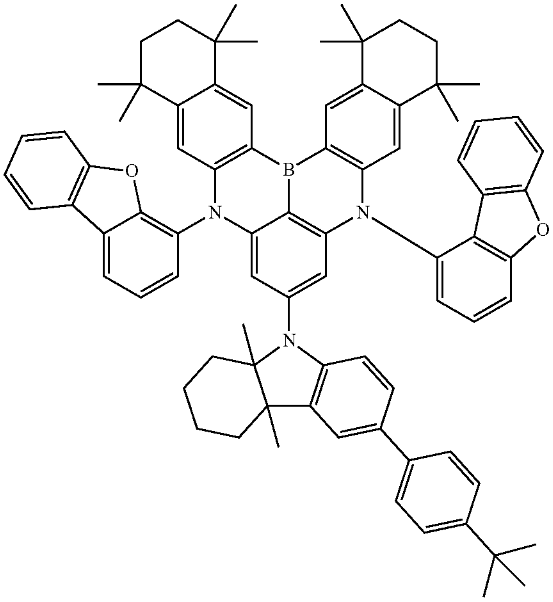 [SMILES: CC(C)(C)c1ccc(-c2ccc3c(c2)C2(C)CCCCC2(C)N3c2cc3c4c(c2)N(c2cccc5oc6ccccc6c25)c2cc5c(cc2B4c2cc4c(cc2N3c2cccc3c2oc2ccccc23)C(C)(C)CCC4(C)C)C(C)(C)CCC5(C)C)cc1]
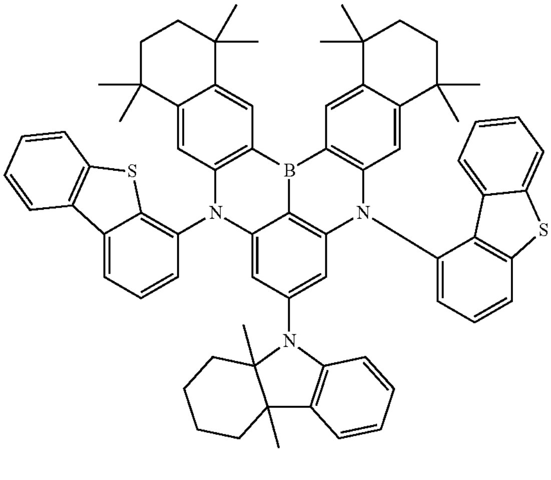
-continued
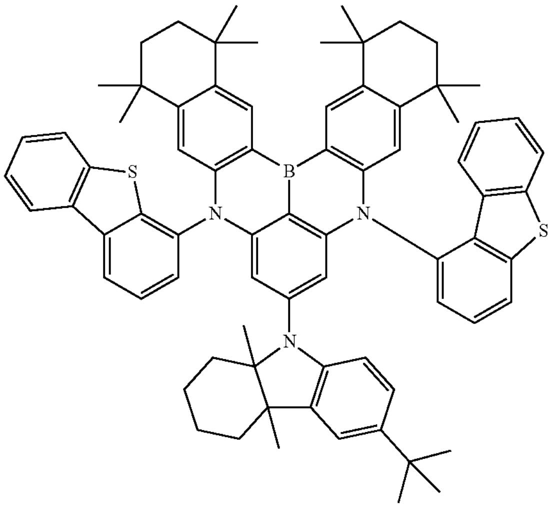
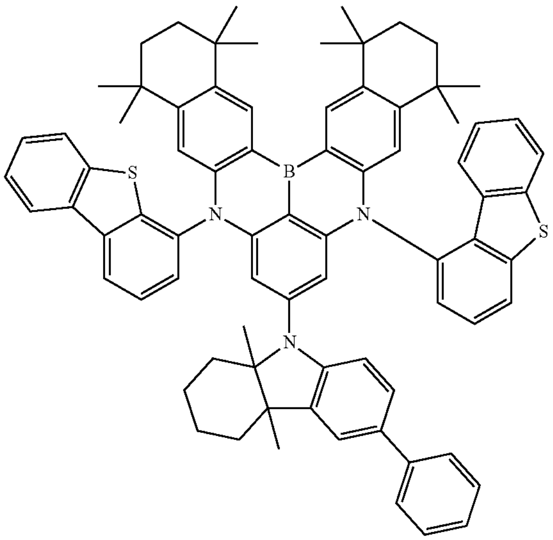
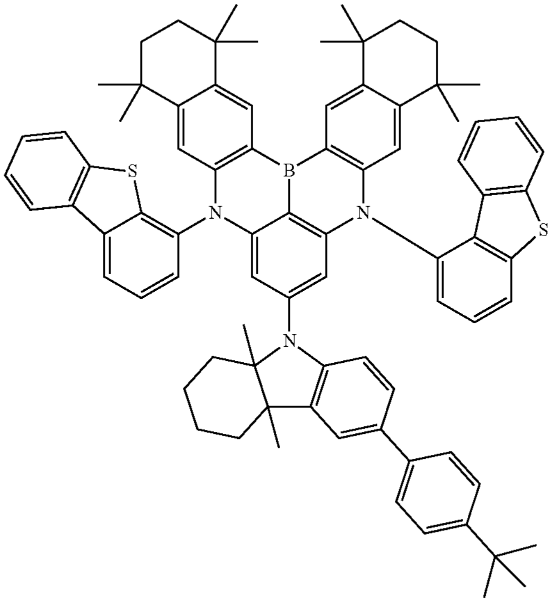 [SMILES: CC(C)(C)c1ccc(-c2ccc3c(c2)C2(C)CCCCC2(C)N3c2cc3c4c(c2)N(c2cccc5sc6ccccc6c25)c2cc5c(cc2B4c2cc4c(cc2N3c2cccc3c2sc2ccccc23)C(C)(C)CCC4(C)C)C(C)(C)CCC5(C)C)cc1]

-continued
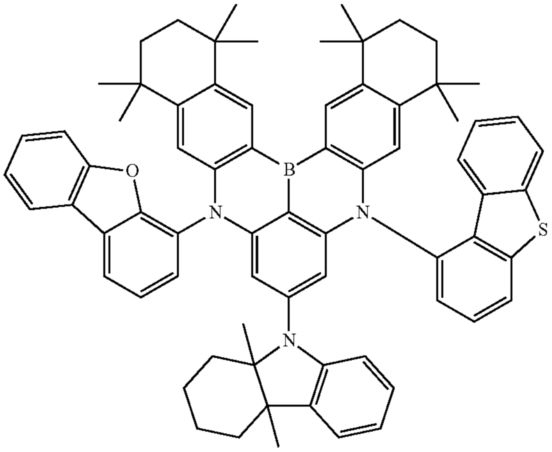
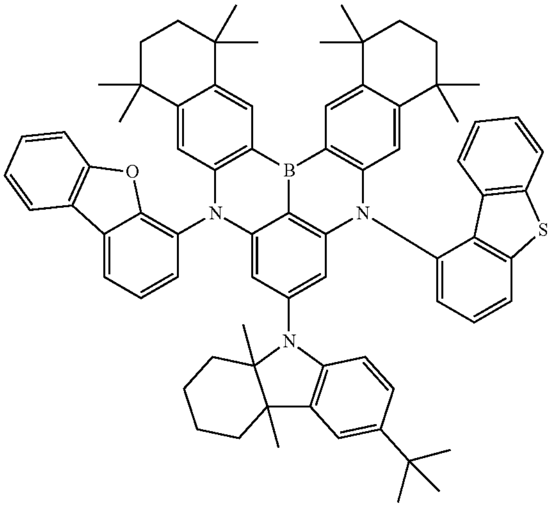
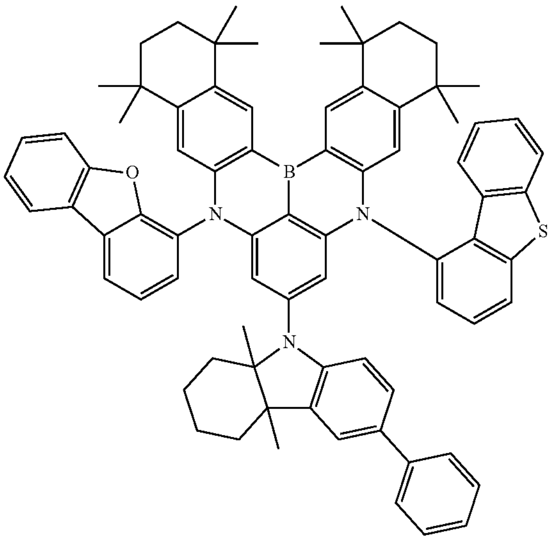
-continued
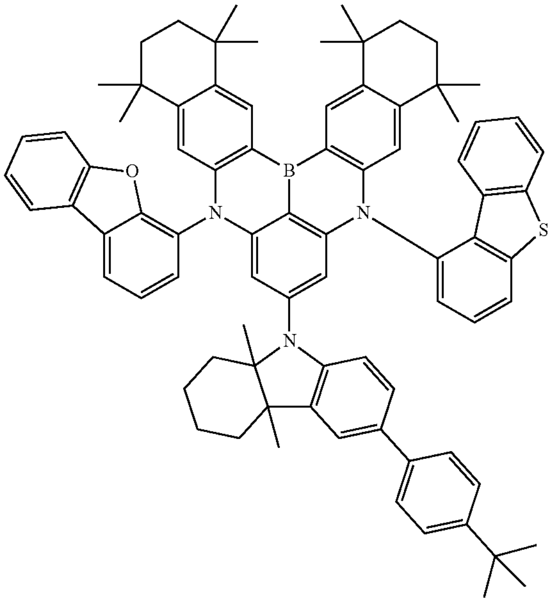 [SMILES: CC(C)(C)c1ccc(-c2ccc3c(c2)C2(C)CCCCC2(C)N3c2cc3c4c(c2)N(c2cccc5sc6ccccc6c25)c2cc5c(cc2B4c2cc4c(cc2N3c2cccc3c2oc2ccccc23)C(C)(C)CCC4(C)C)C(C)(C)CCC5(C)C)cc1]
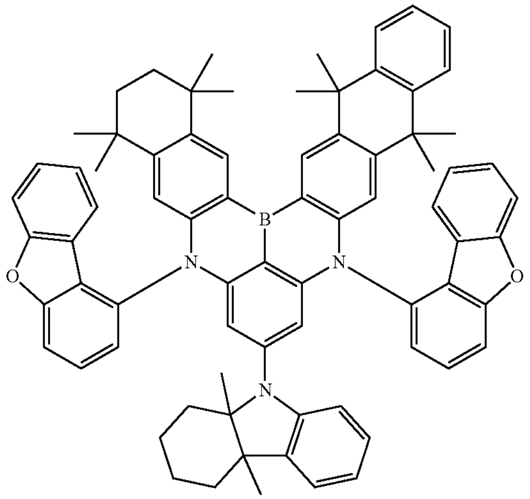

-continued
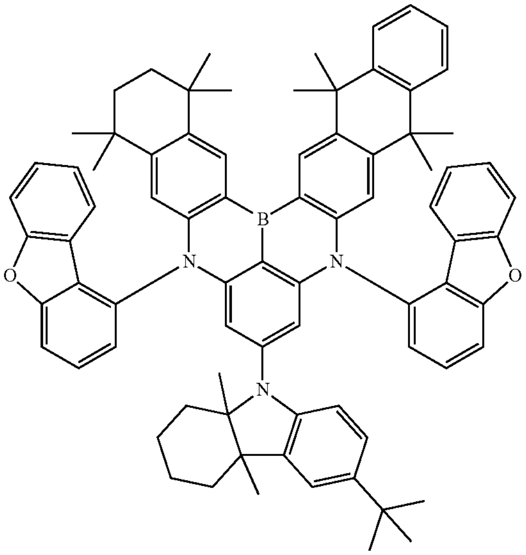
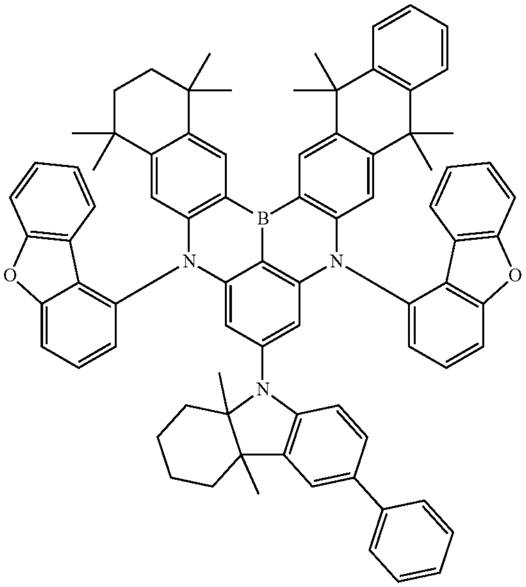
-continued
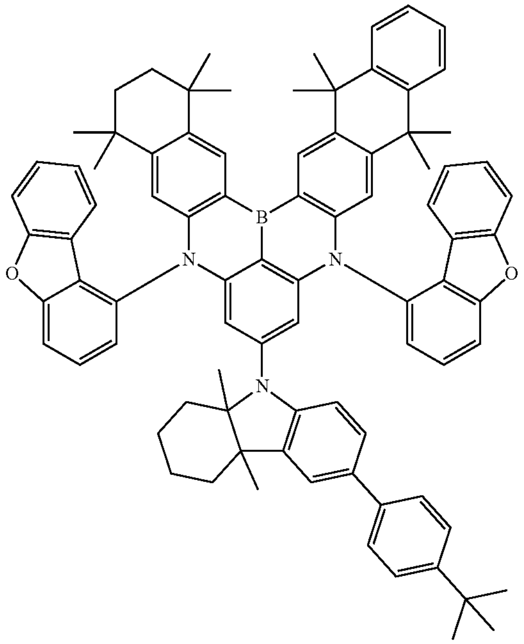 [SMILES: CC(C)(C)c1ccc(-c2ccc3c(c2)C2(C)CCCCC2(C)N3c2cc3c4c(c2)N(c2cccc5oc6ccccc6c25)c2cc5c(cc2B4c2cc4c(cc2N3c2cccc3oc6ccccc6c23)C(C)(C)CCC4(C)C)C(C)(C)c2ccccc2C5(C)C)cc1]
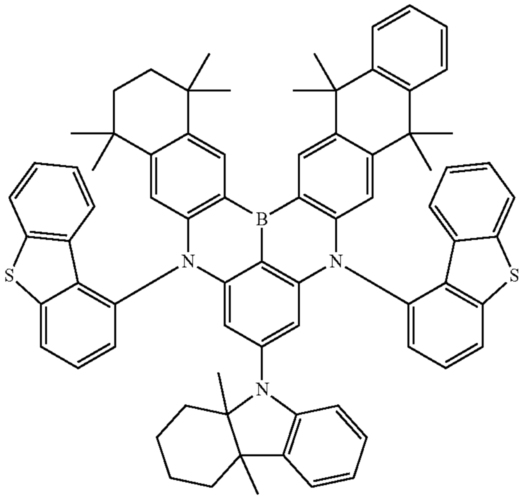
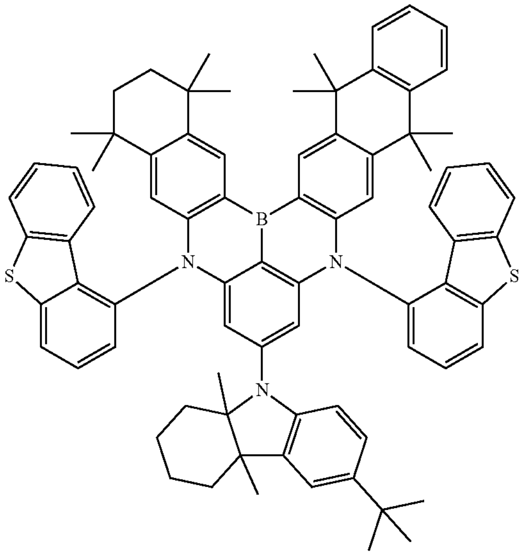

-continued
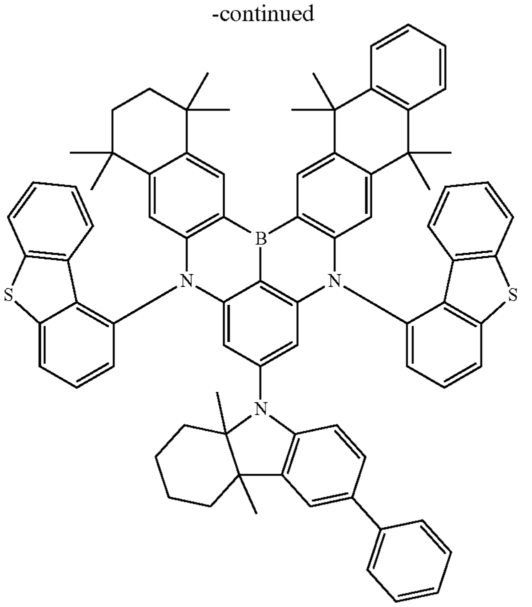
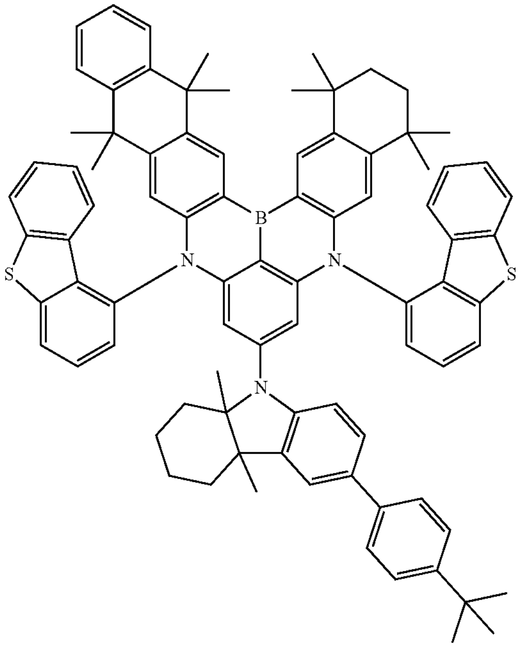 [SMILES: CC(C)(C)c1ccc(-c2ccc3c(c2)C2(C)CCCCC2(C)N3c2cc3c4c(c2)N(c2cccc5sc6ccccc6c25)c2cc5c(cc2B4c2cc4c(cc2N3c2cccc3sc6ccccc6c23)C(C)(C)CCC4(C)C)C(C)(C)c2ccccc2C5(C)C)cc1]
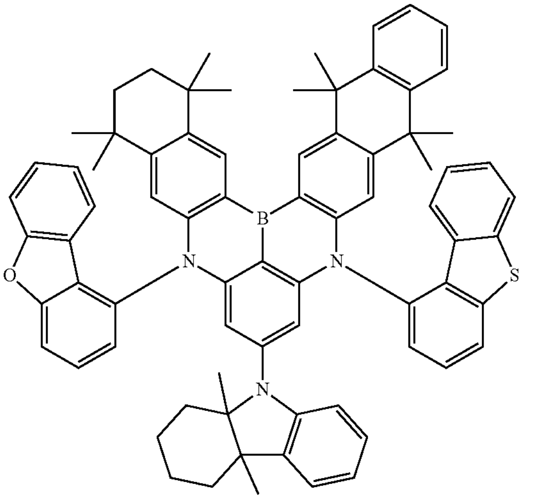
-continued
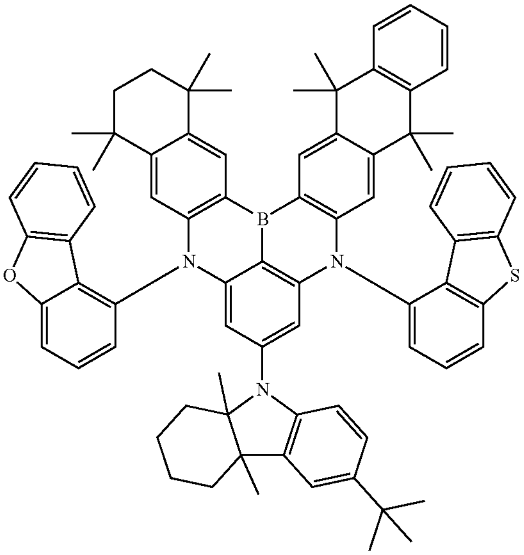
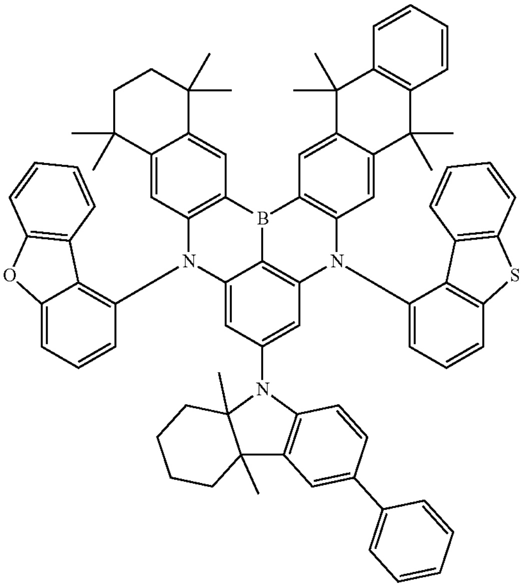

-continued
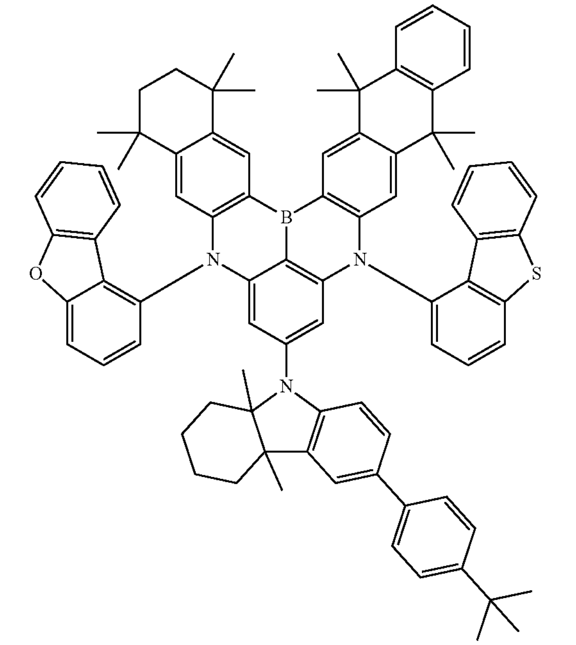
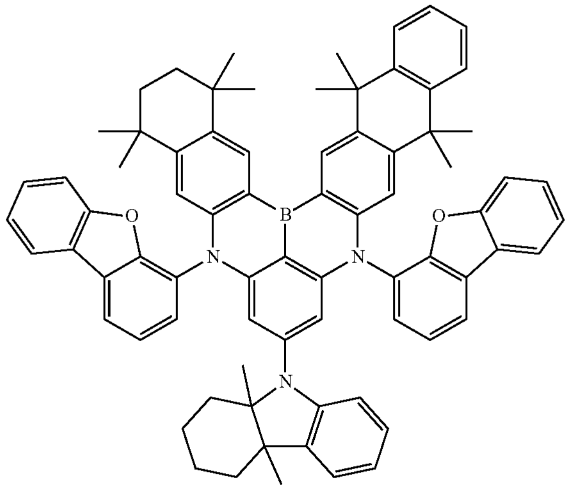
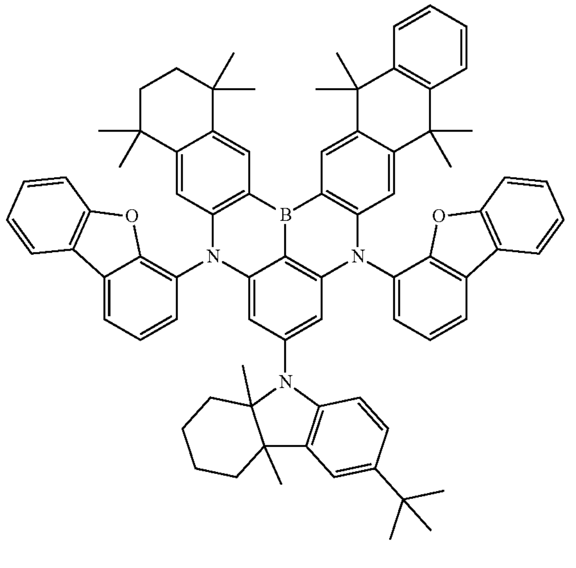
-continued
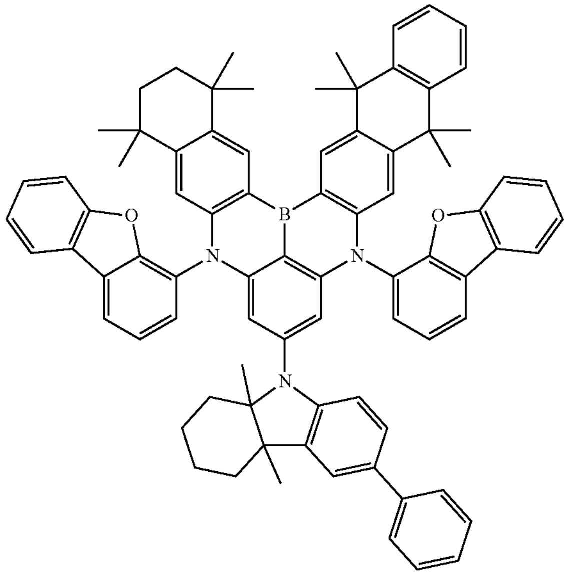
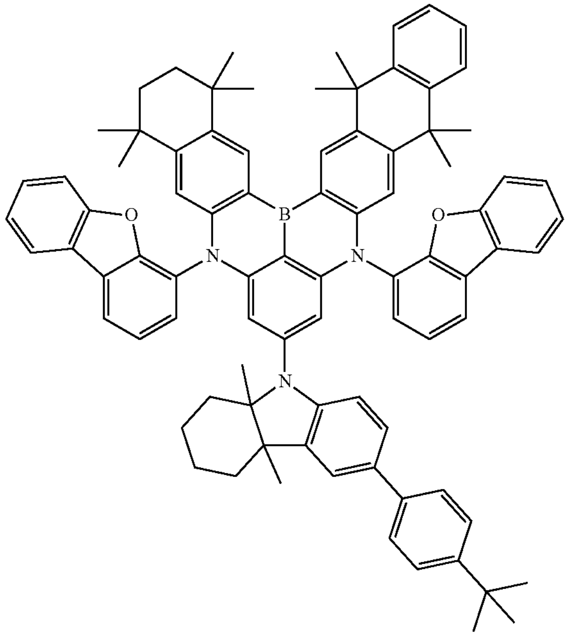 [SMILES: CC(C)(C)c1ccc(-c2ccc3c(c2)C2(C)CCCCC2(C)N3c2cc3c4c(c2)N(c2cccc5c2oc2ccccc25)c2cc5c(cc2B4c2cc4c(cc2N3c2cccc3c2oc2ccccc23)C(C)(C)CCC4(C)C)C(C)(C)c2ccccc2C5(C)C)cc1]
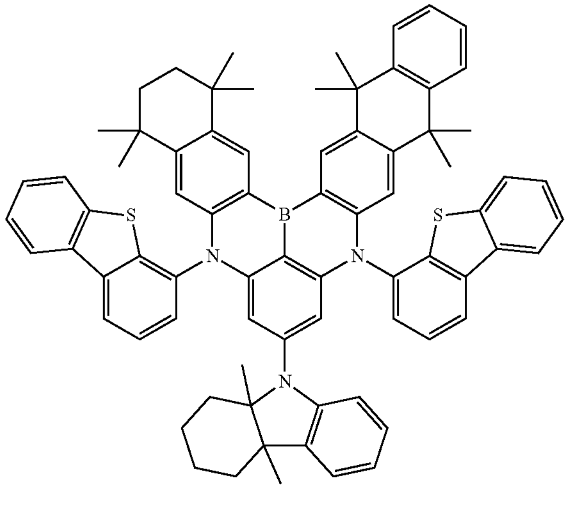

-continued
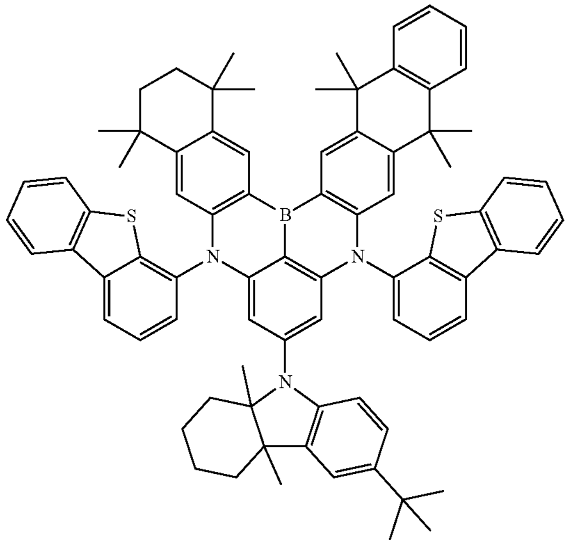
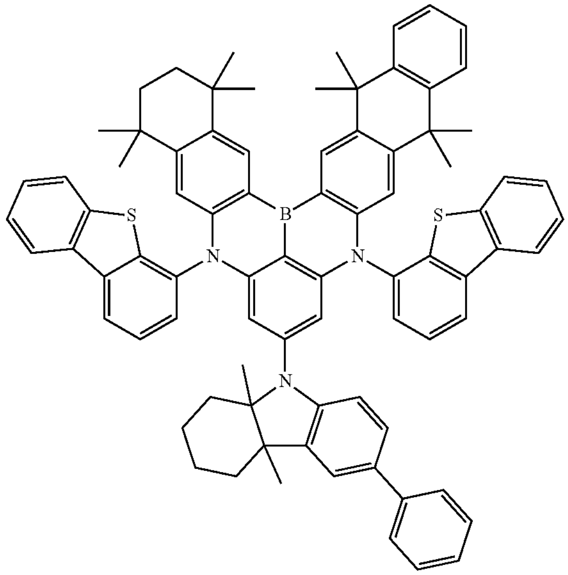
-continued
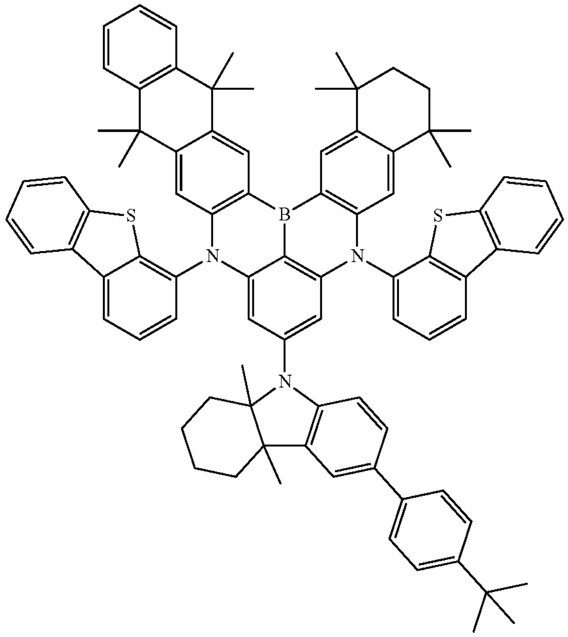 [SMILES: CC(C)(C)c1ccc(-c2ccc3c(c2)C2(C)CCCCC2(C)N3c2cc3c4c(c2)N(c2cccc5c2sc2ccccc25)c2cc5c(cc2B4c2cc4c(cc2N3c2cccc3c2sc2ccccc23)C(C)(C)CCC4(C)C)C(C)(C)c2ccccc2C5(C)C)cc1]
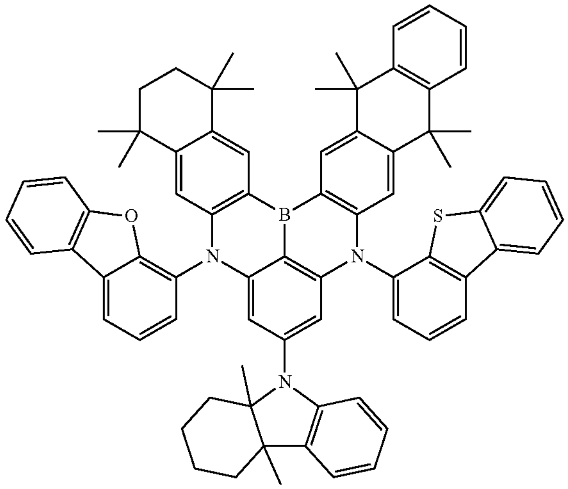
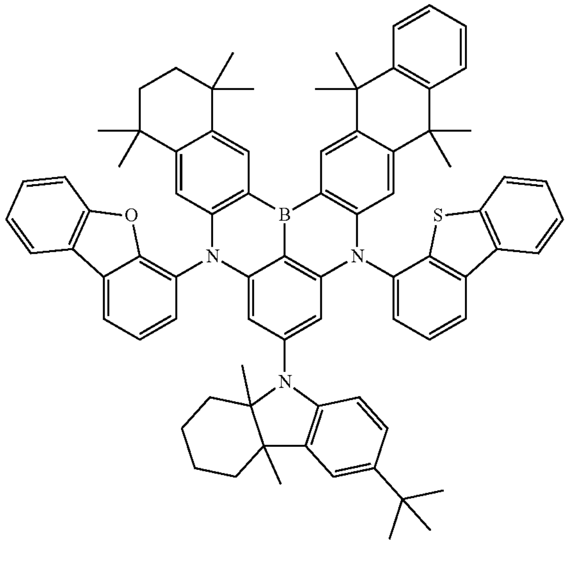

-continued
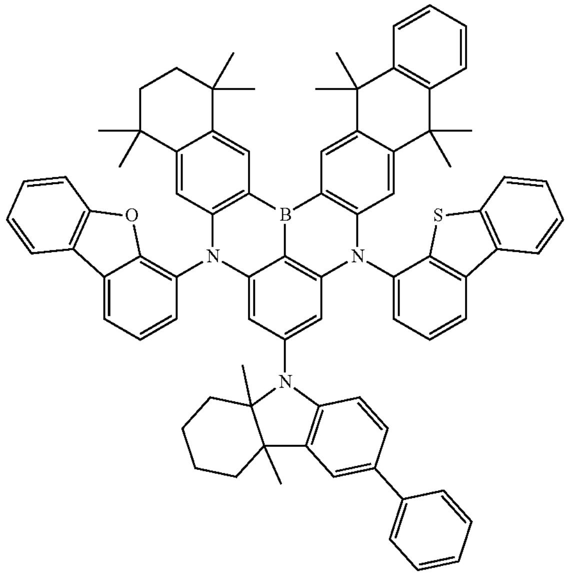
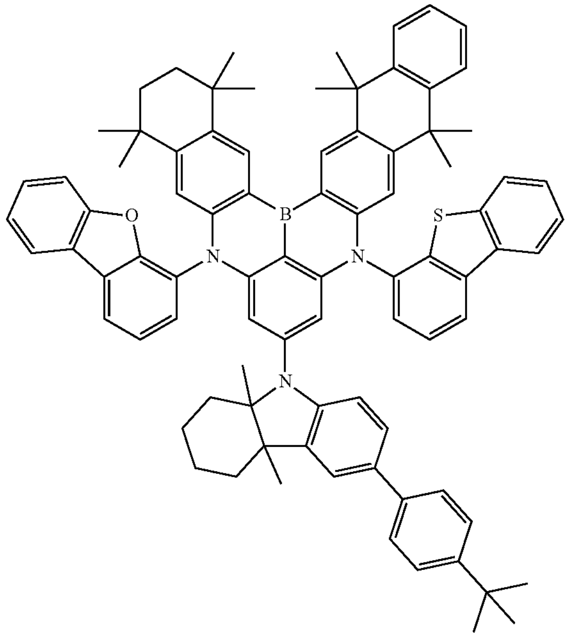 [SMILES: CC(C)(C)c1ccc(-c2ccc3c(c2)C2(C)CCCCC2(C)N3c2cc3c4c(c2)N(c2cccc5c2sc2ccccc25)c2cc5c(cc2B4c2cc4c(cc2N3c2cccc3c2oc2ccccc23)C(C)(C)CCC4(C)C)C(C)(C)c2ccccc2C5(C)C)cc1]
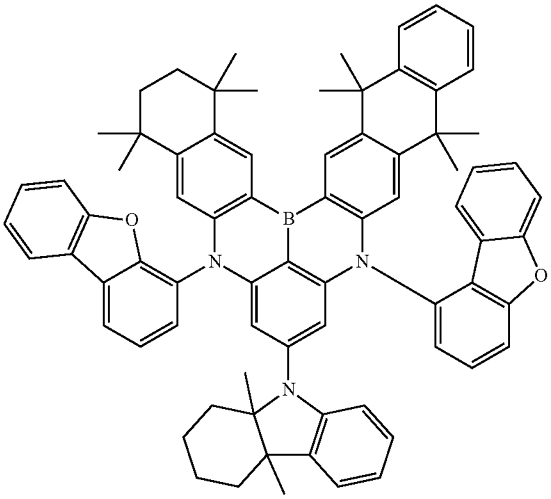
-continued
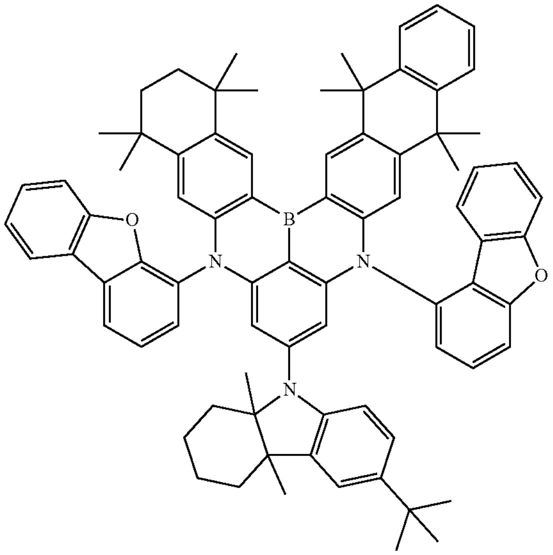
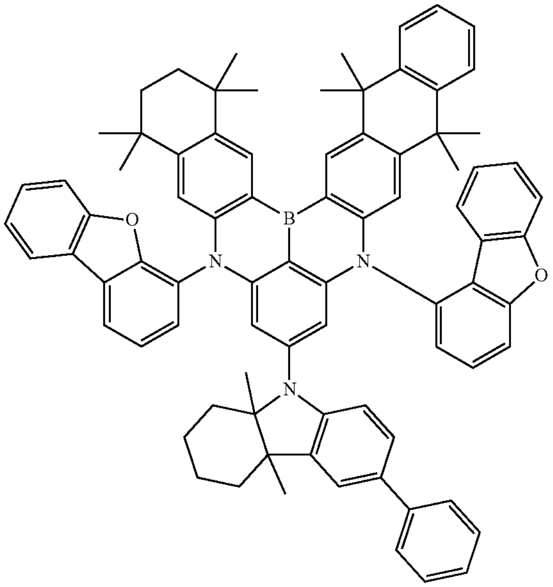

-continued
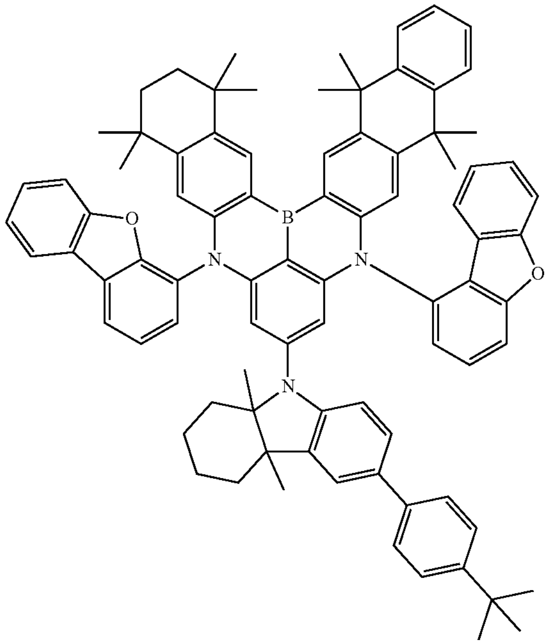 [SMILES: CC(C)(C)c1ccc(-c2ccc3c(c2)C2(C)CCCCC2(C)N3c2cc3c4c(c2)N(c2cccc5oc6ccccc6c25)c2cc5c(cc2B4c2cc4c(cc2N3c2cccc3c2oc2ccccc23)C(C)(C)CCC4(C)C)C(C)(C)c2ccccc2C5(C)C)cc1]
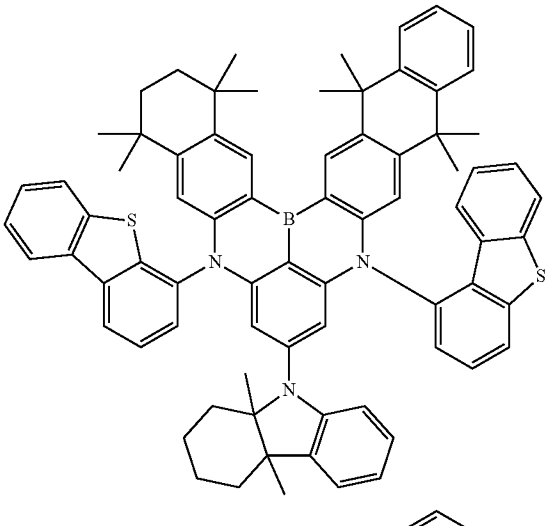
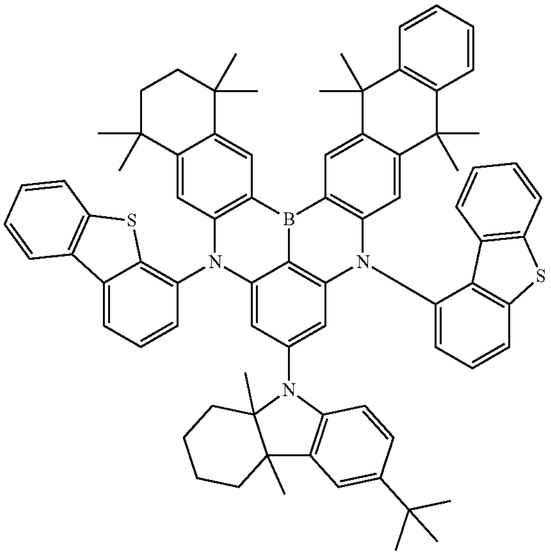
-continued
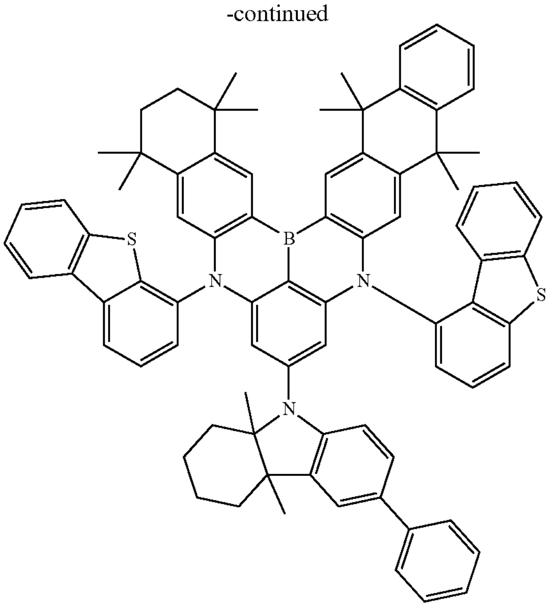
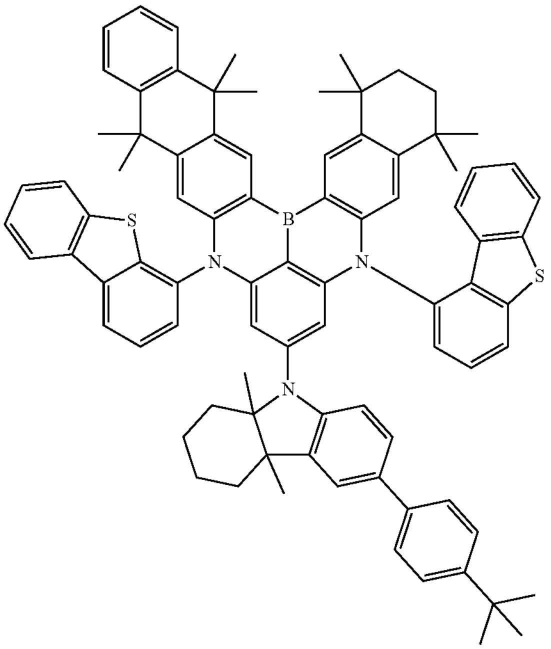 [SMILES: CC(C)(C)c1ccc(-c2ccc3c(c2)C2(C)CCCCC2(C)N3c2cc3c4c(c2)N(c2cccc5sc6ccccc6c25)c2cc5c(cc2B4c2cc4c(cc2N3c2cccc3c2oc2ccccc23)C(C)(C)c2ccccc2C4(C)C)C(C)(C)CCC5(C)C)cc1]
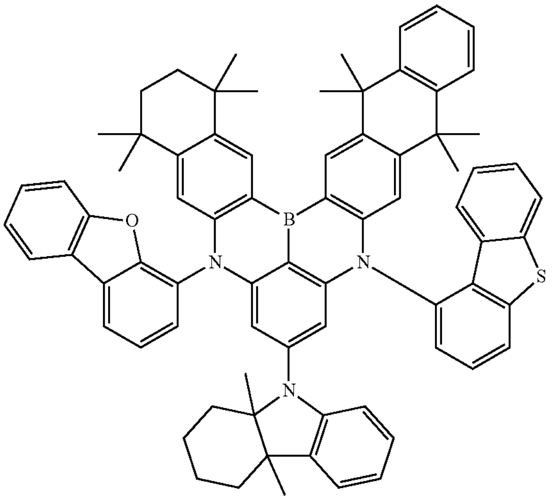

-continued
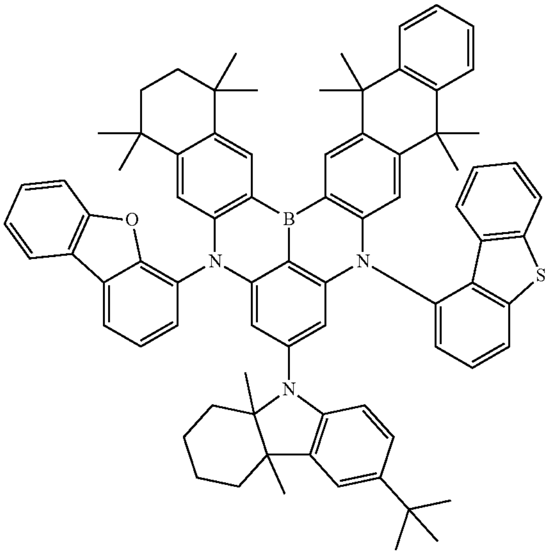
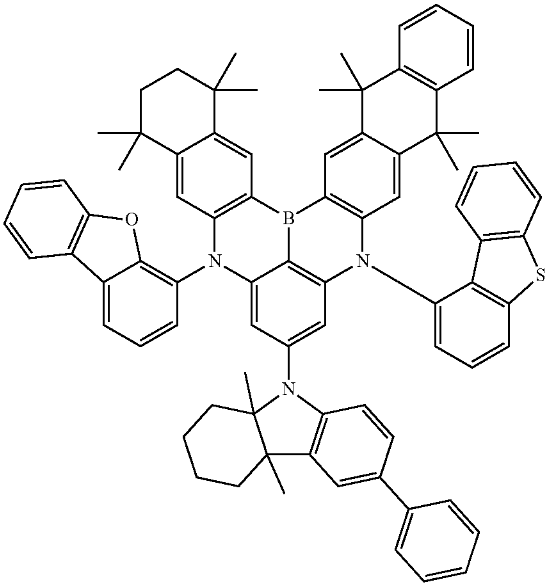
-continued
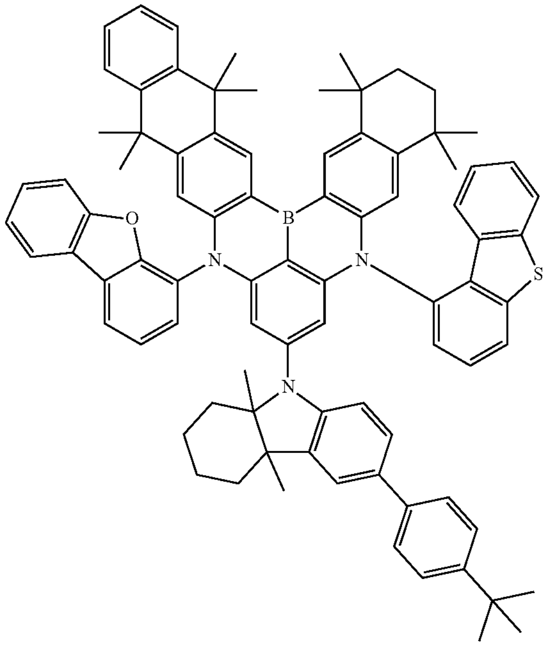
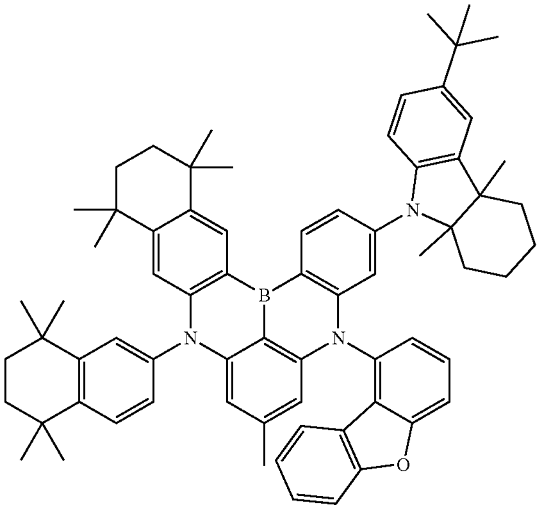

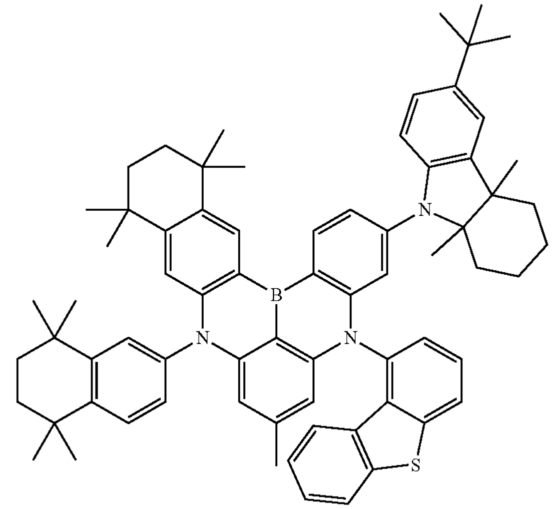
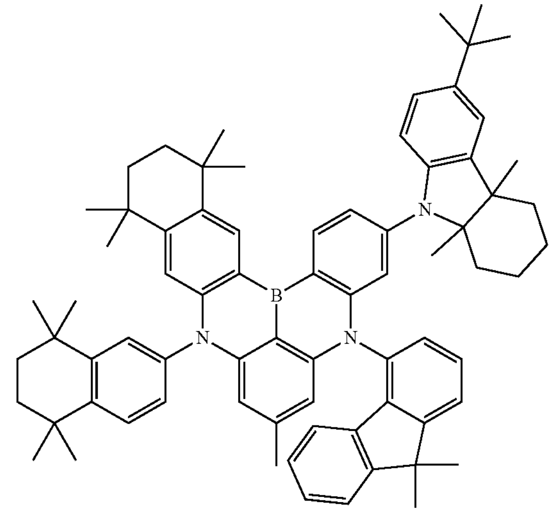
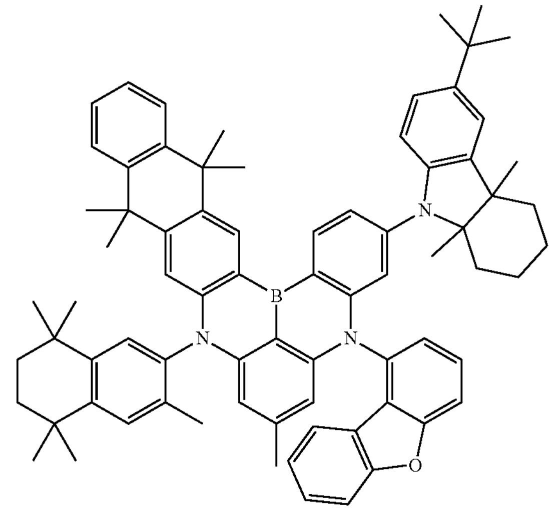
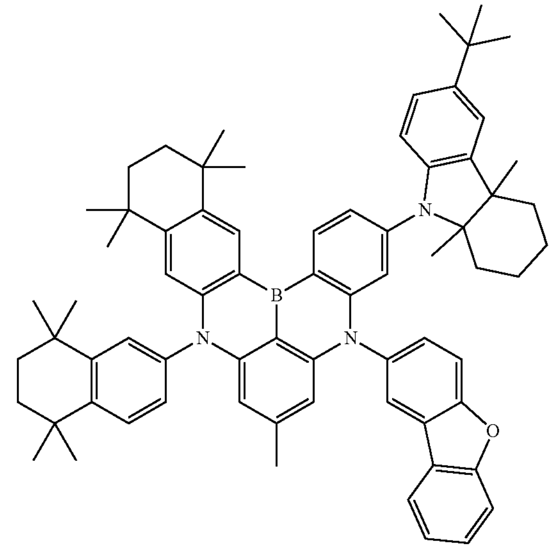
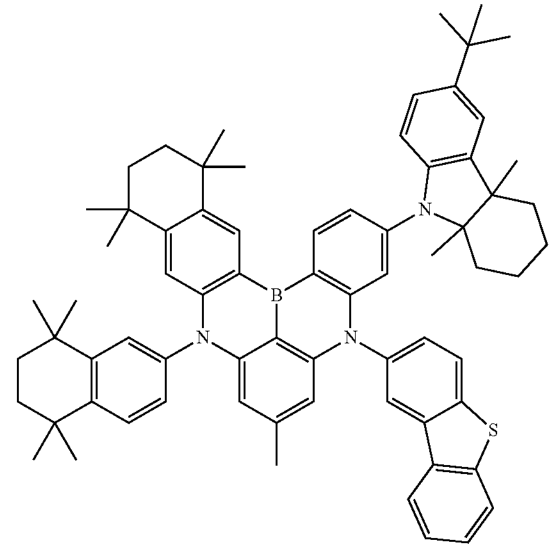
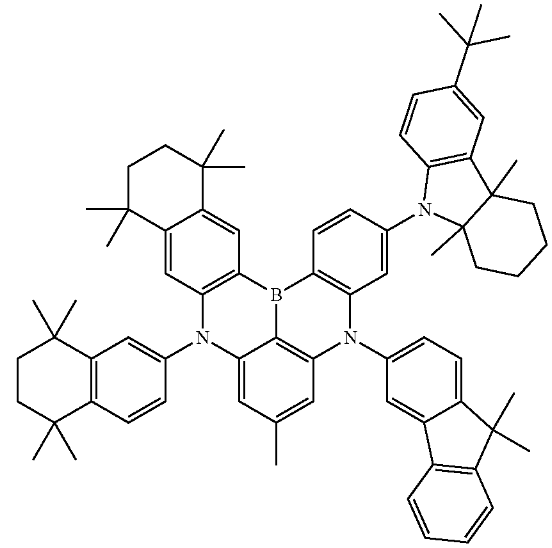

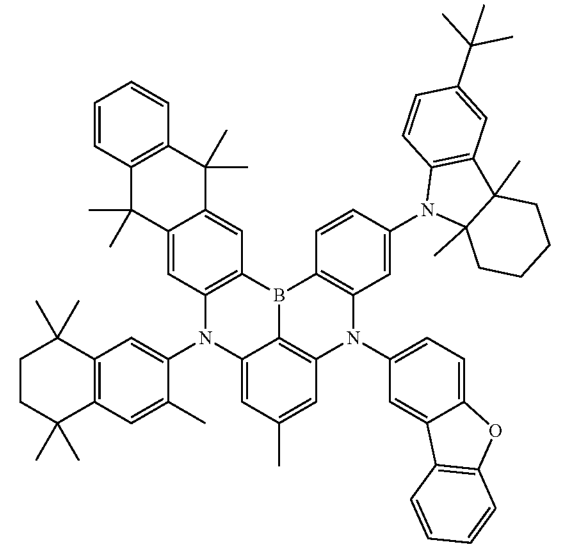
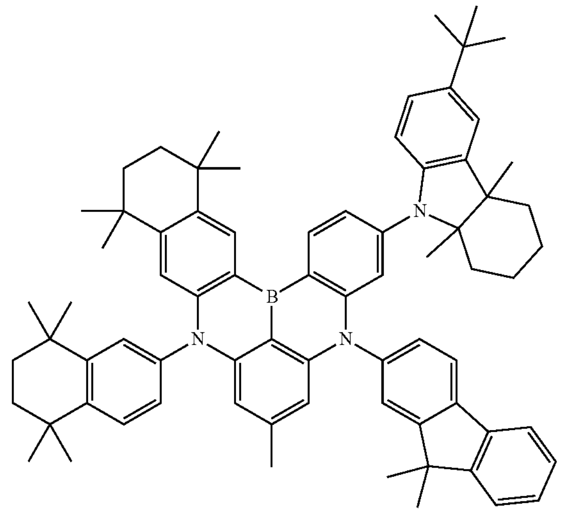
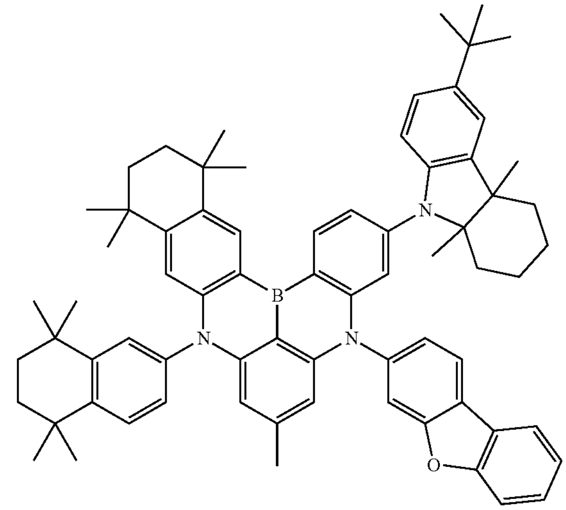
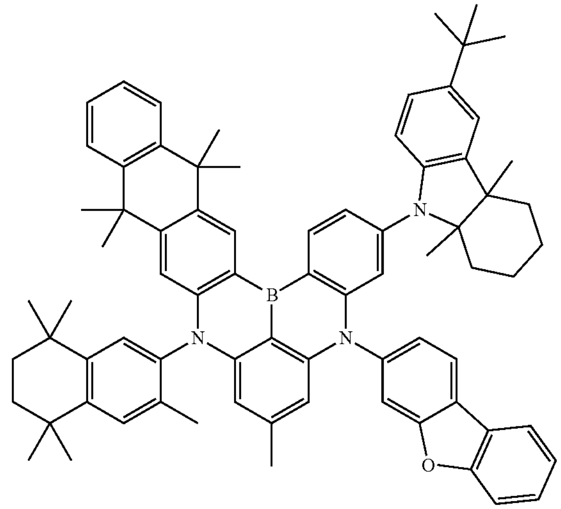
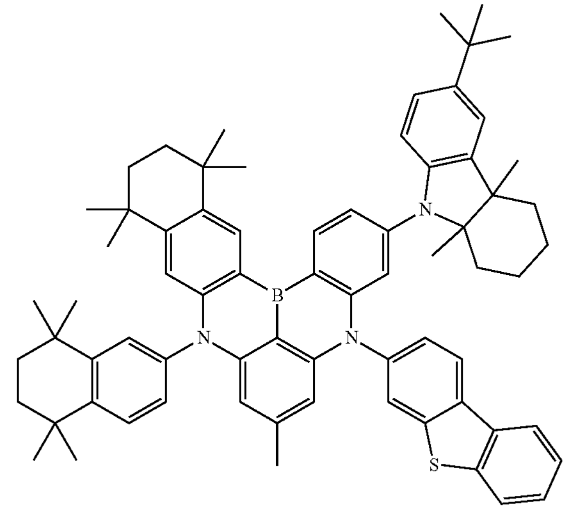
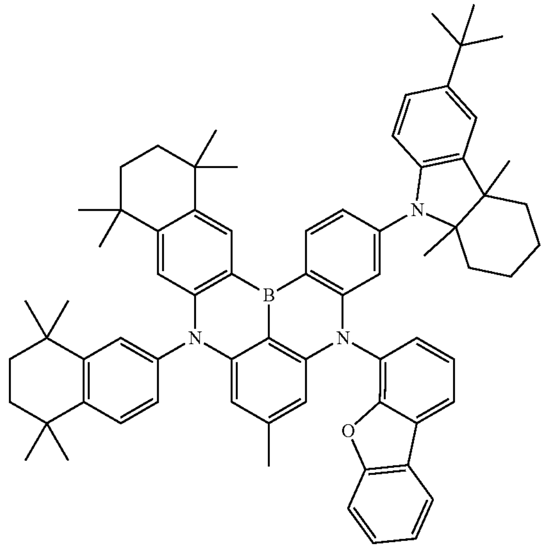

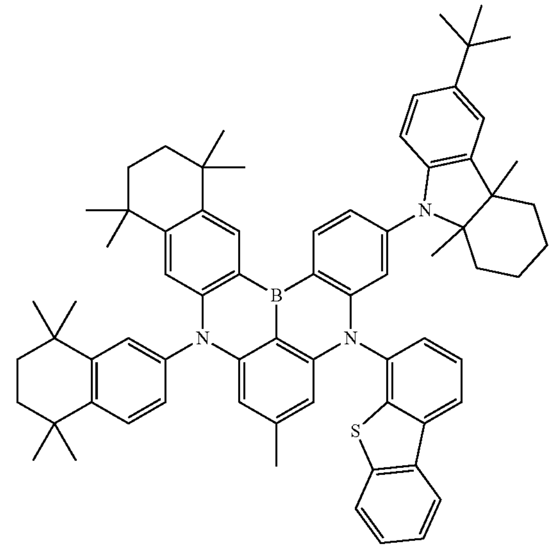
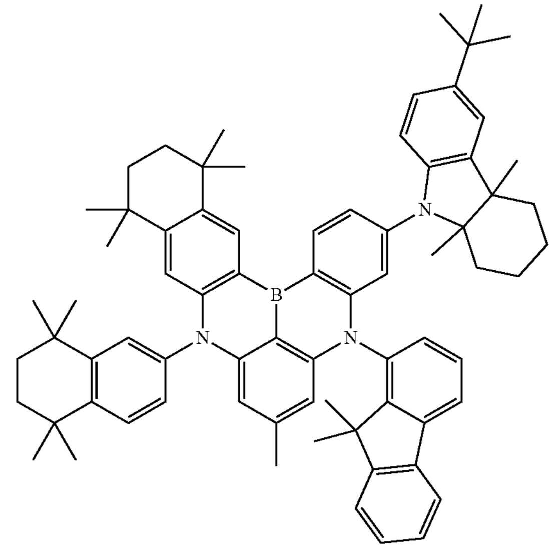
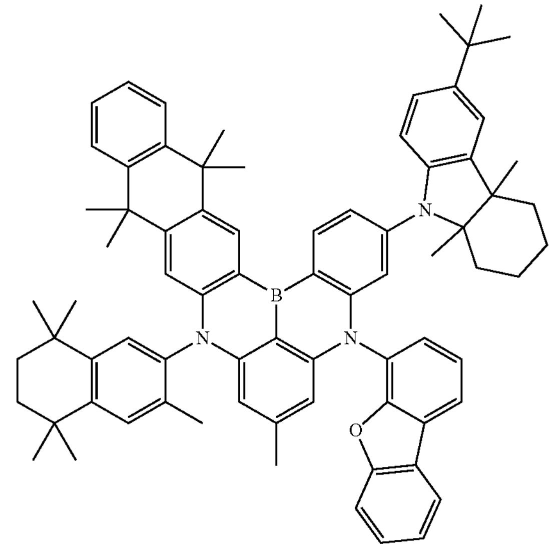
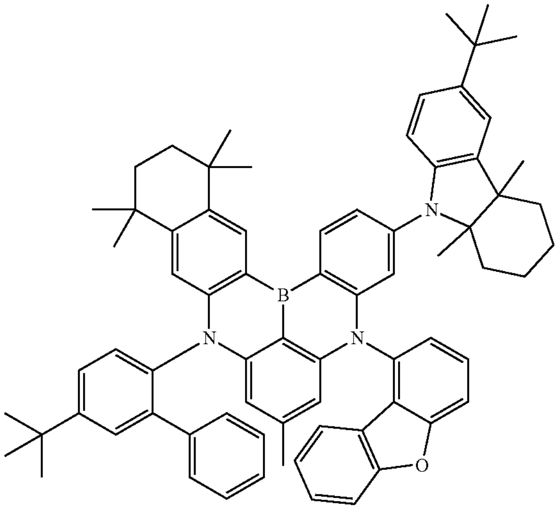
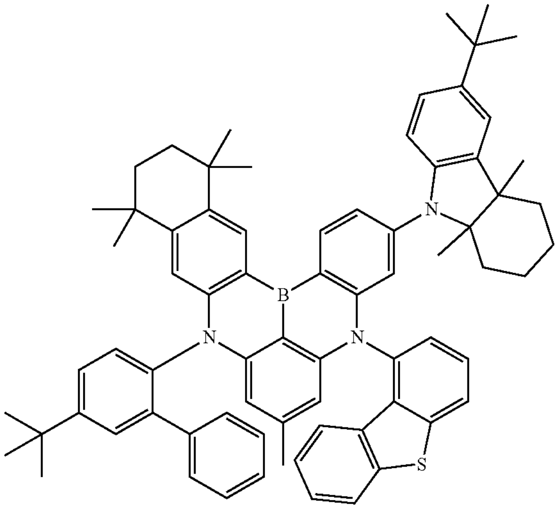
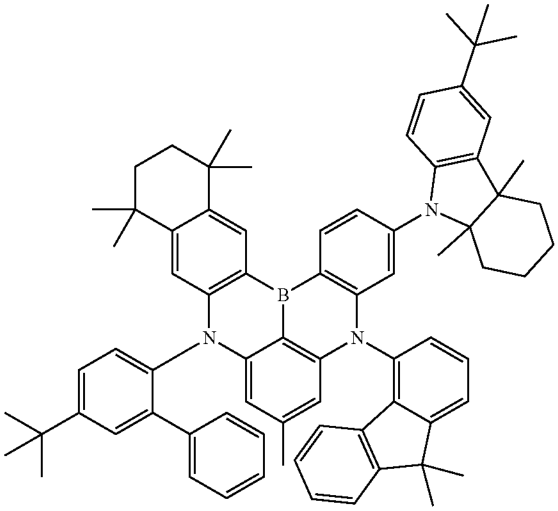

-continued
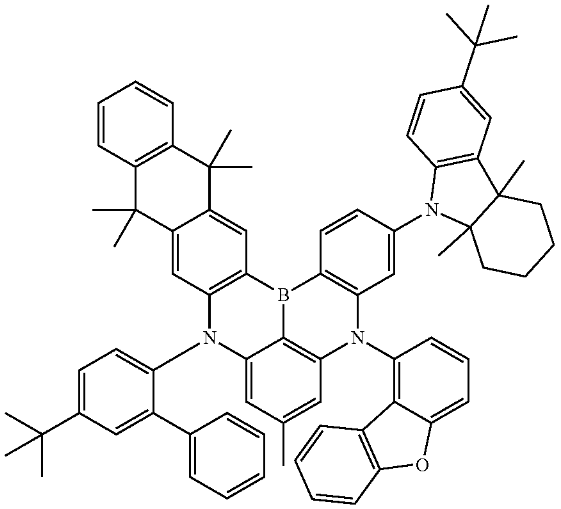
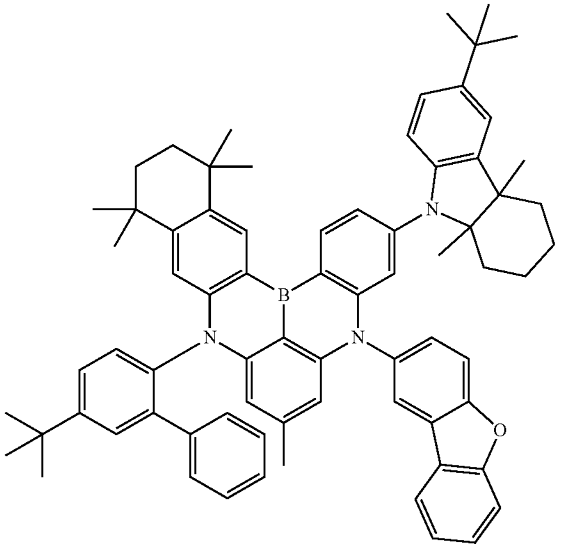
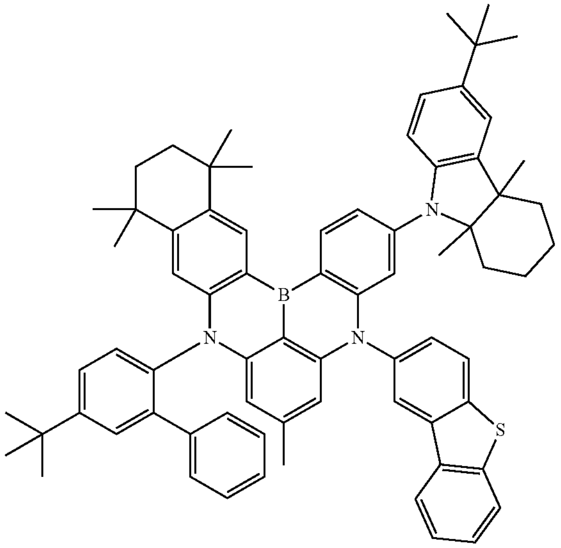
-continued
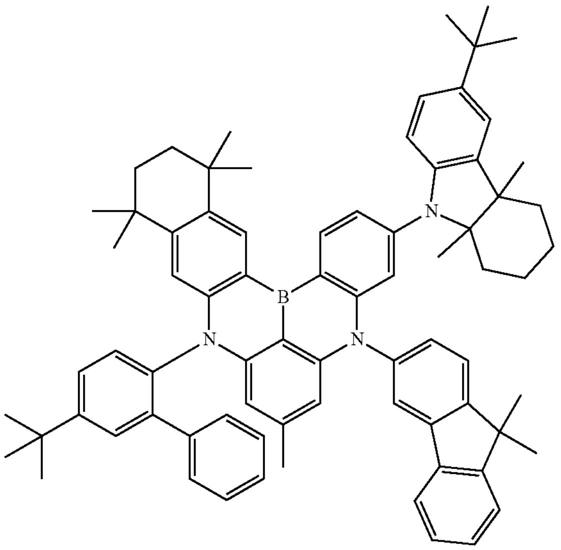
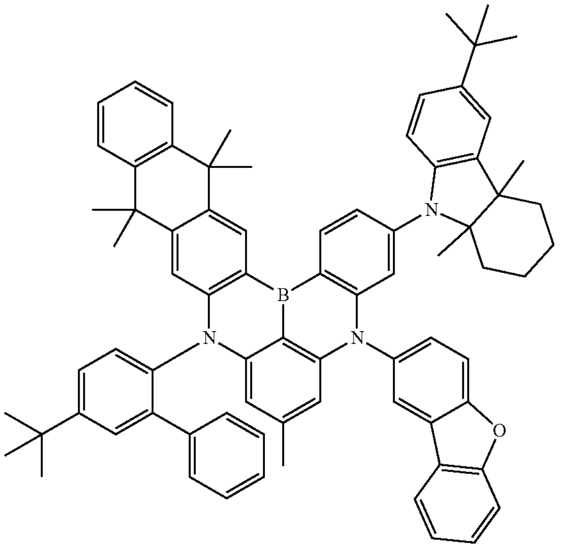
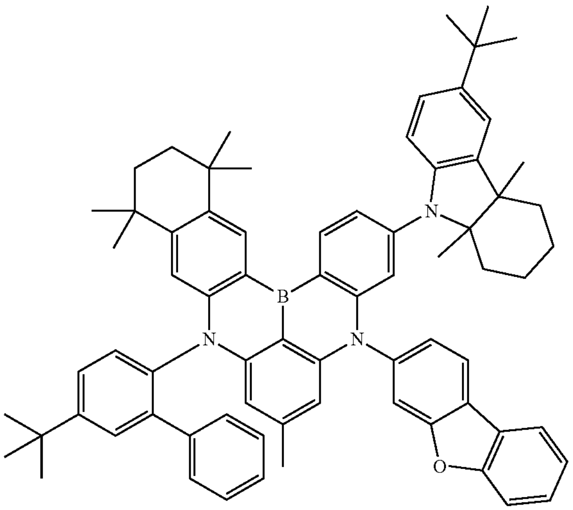

-continued
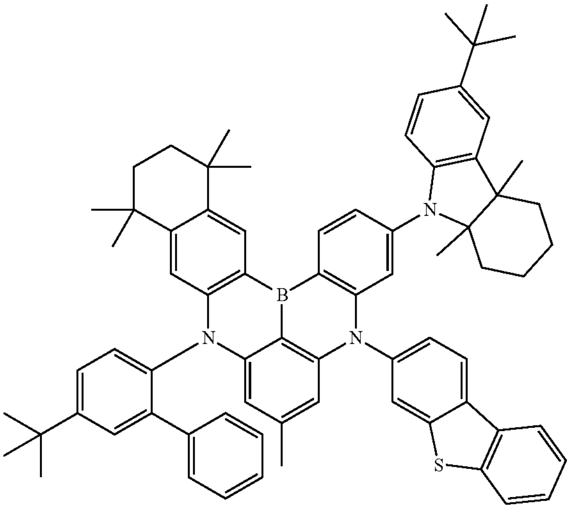
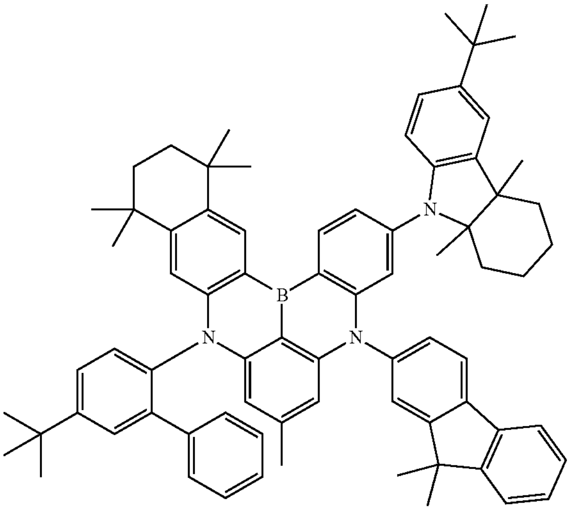
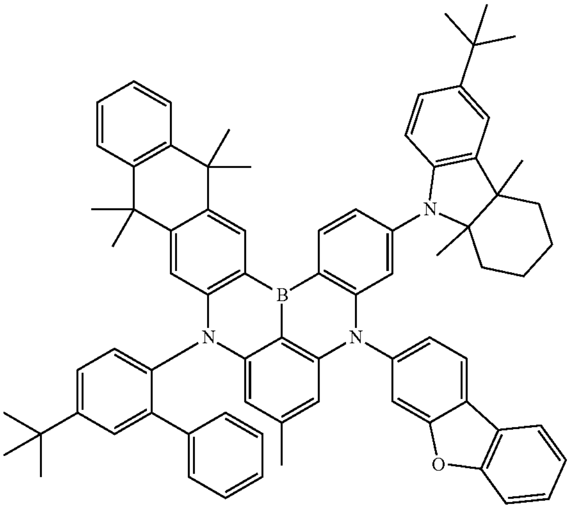
-continued
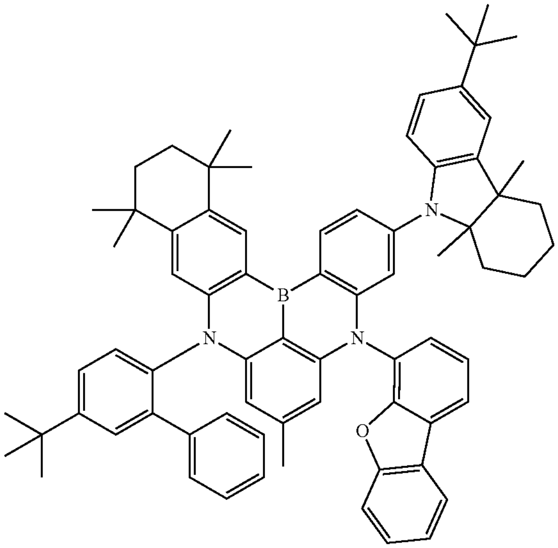
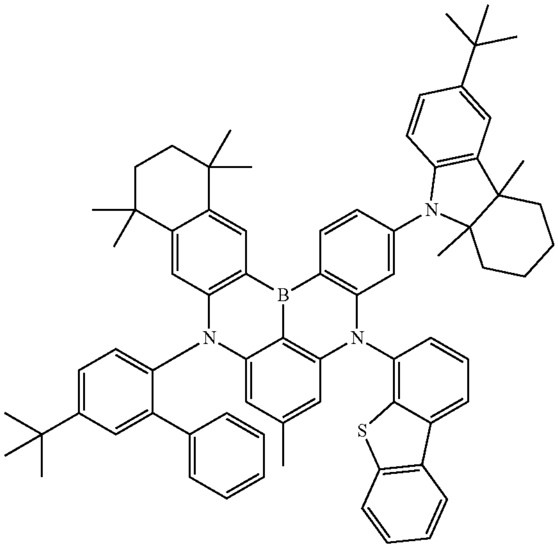
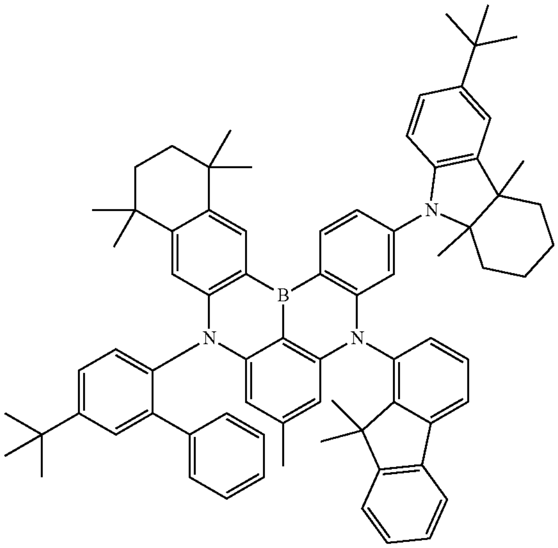

-continued
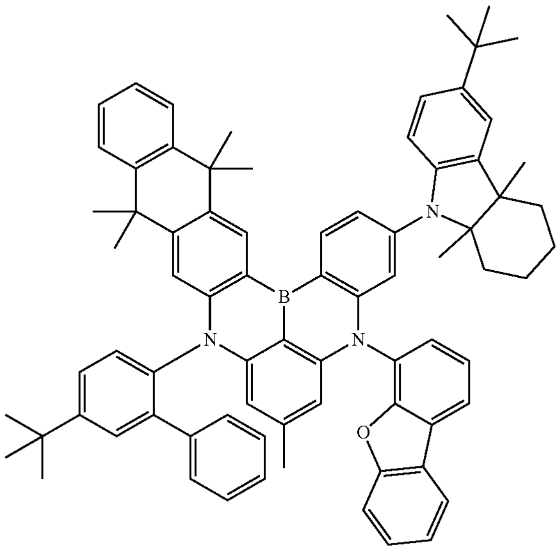
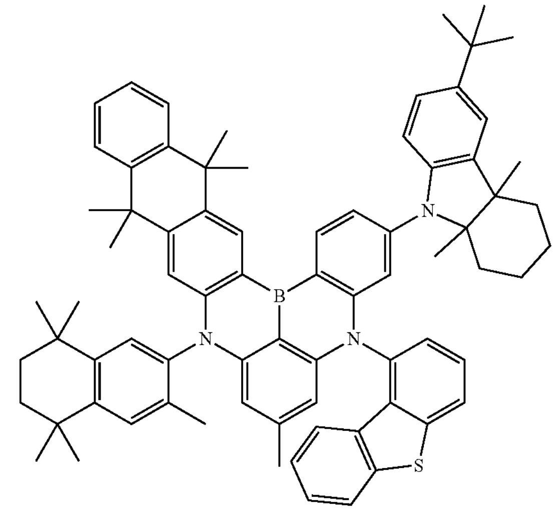
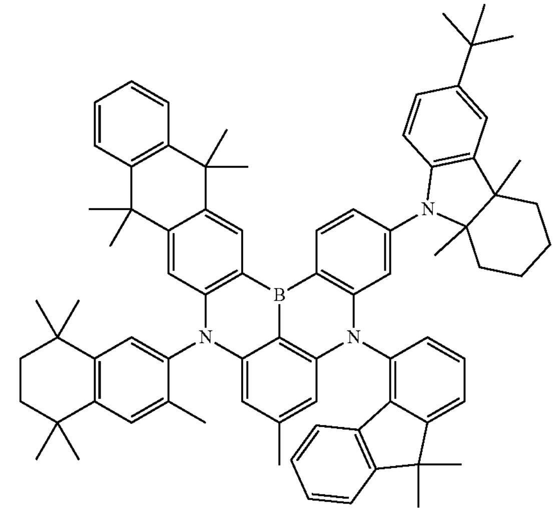
-continued
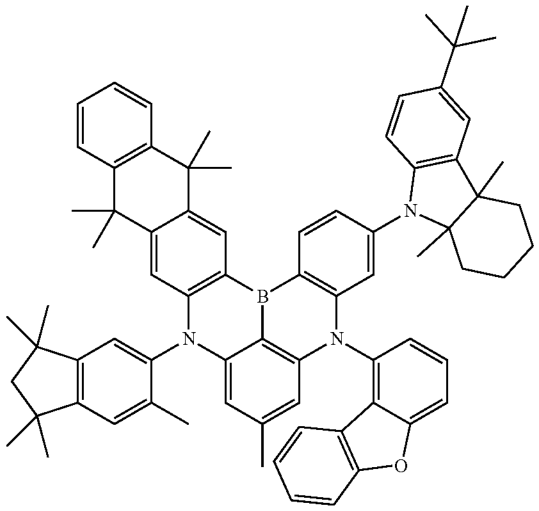
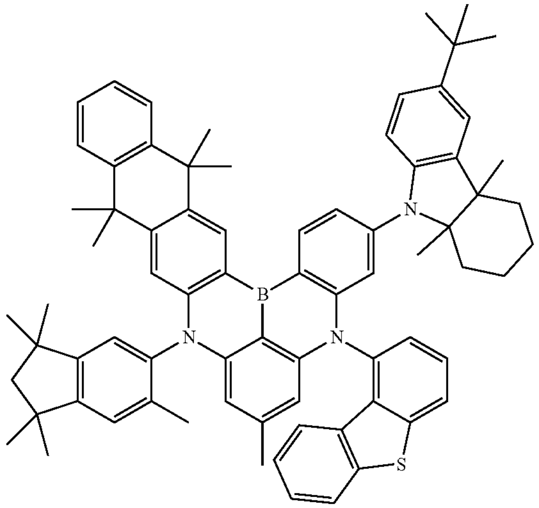
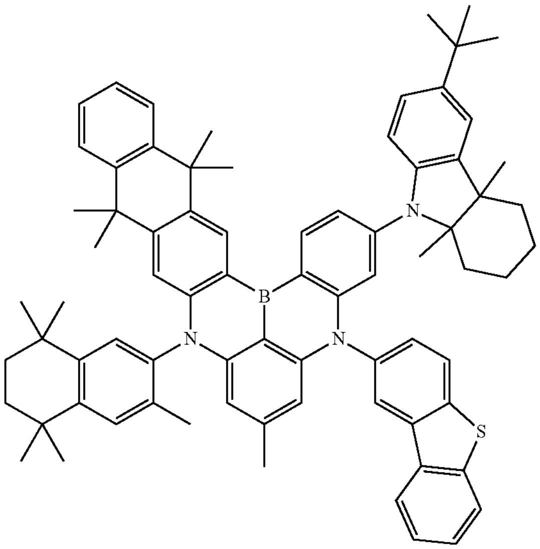

-continued
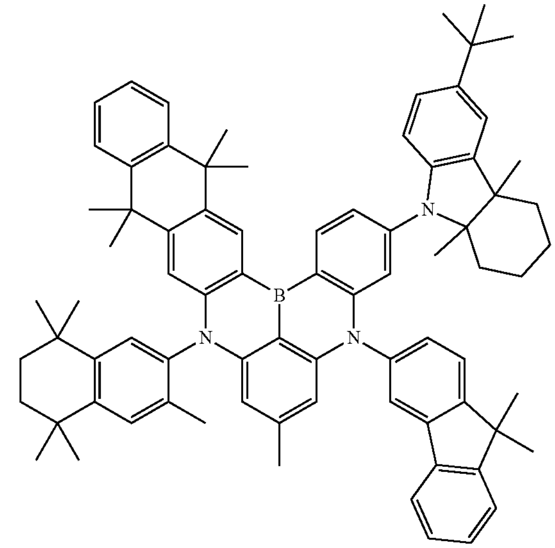
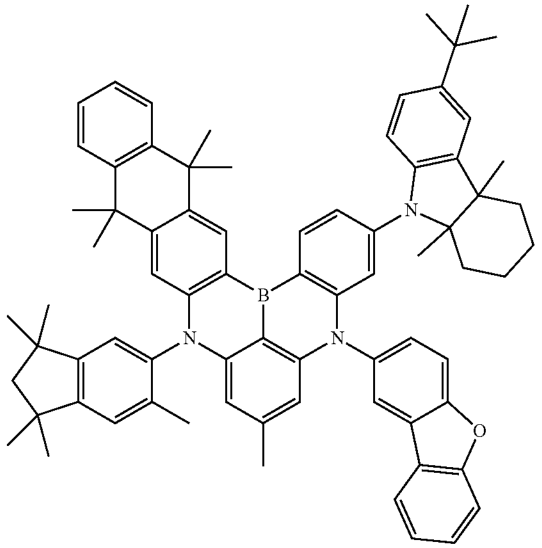
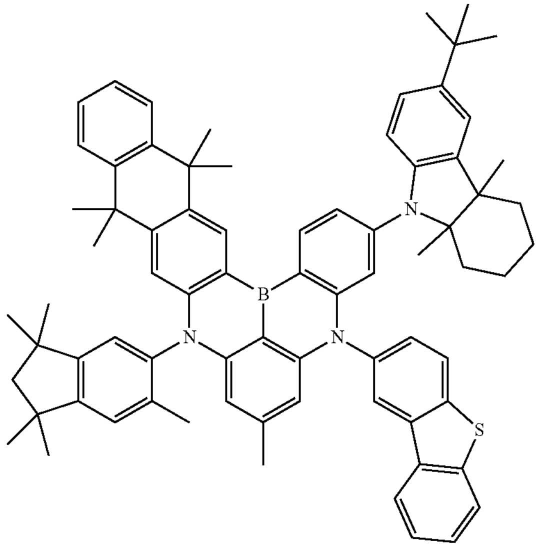
-continued
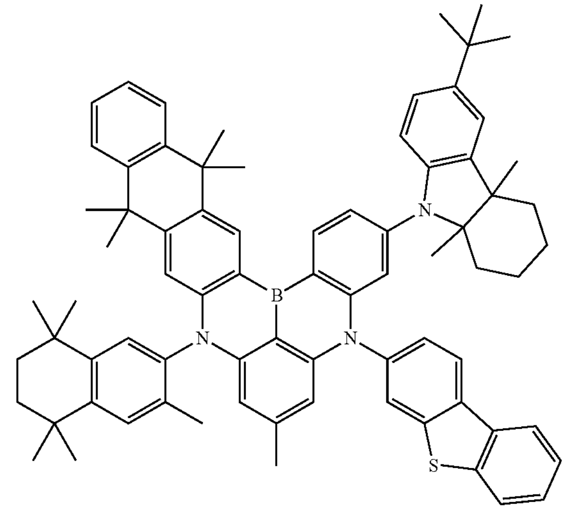
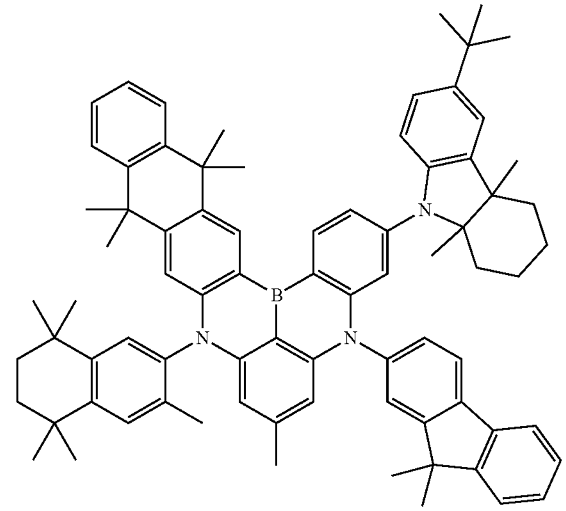
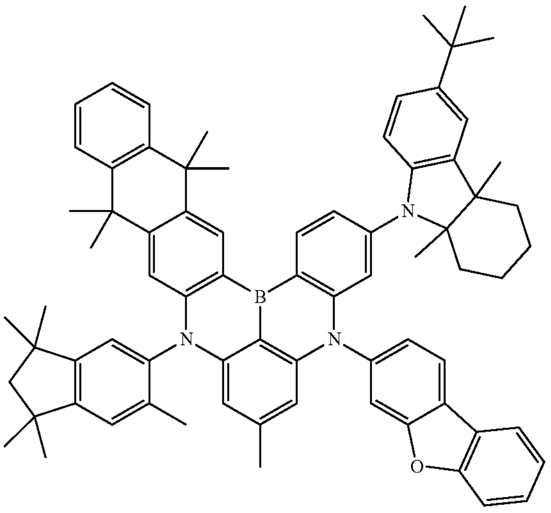

-continued
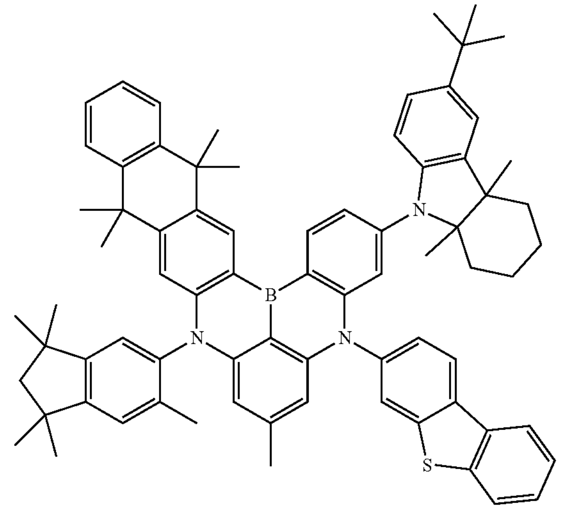
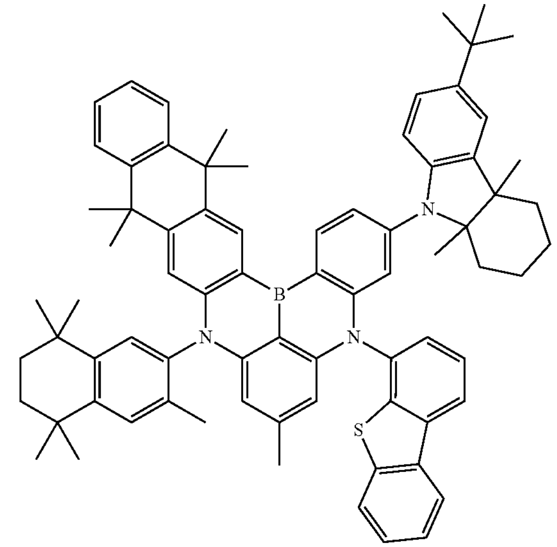
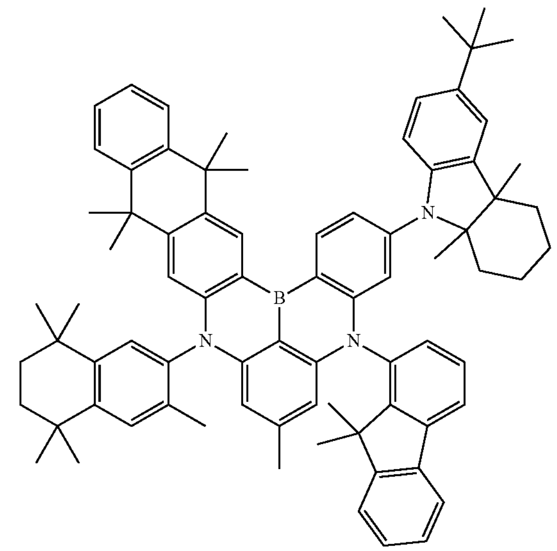
-continued
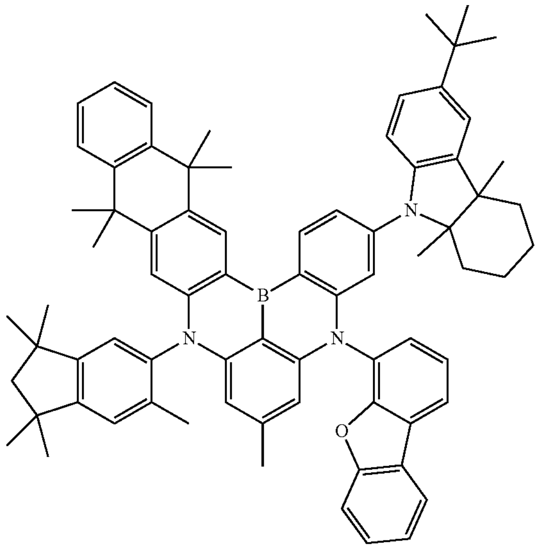
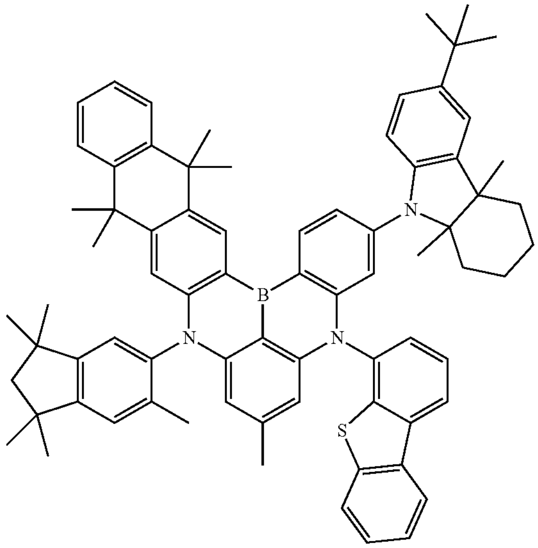
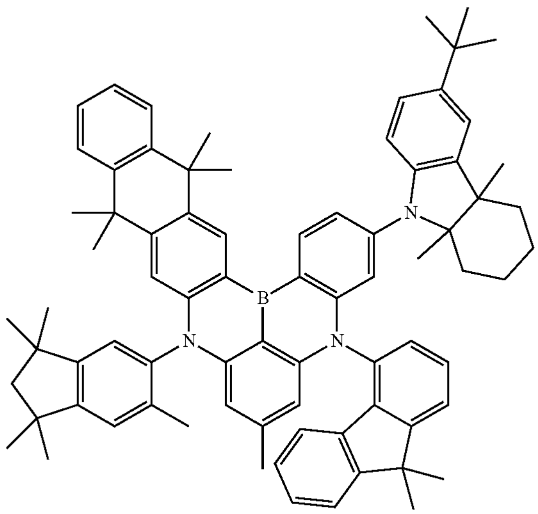

-continued
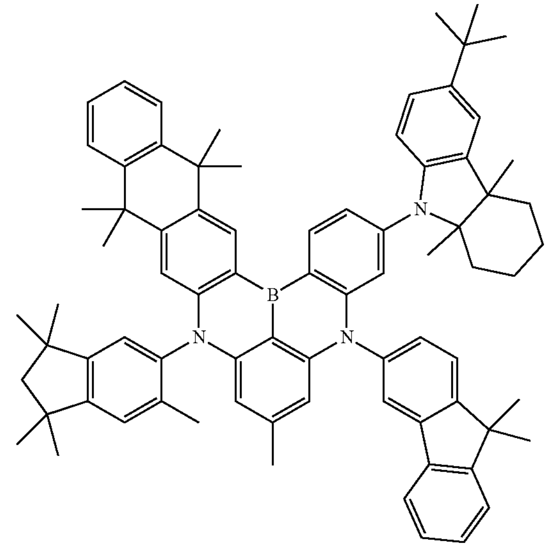
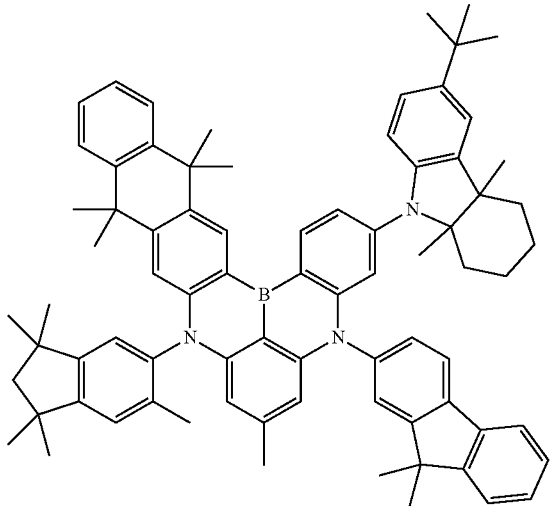
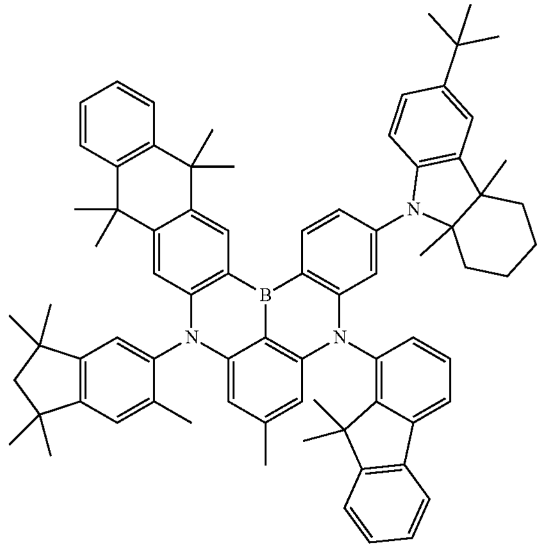
-continued
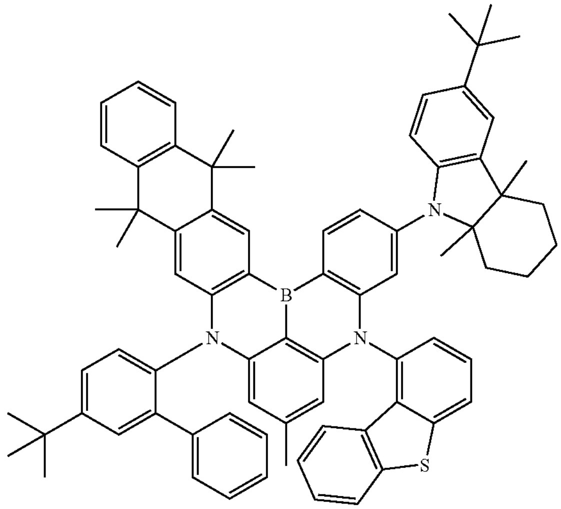
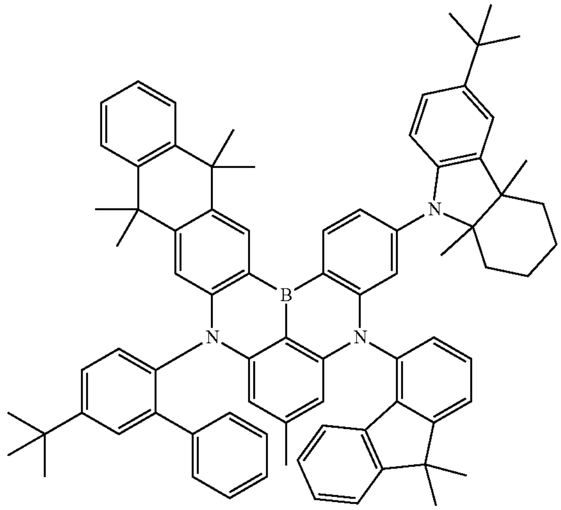
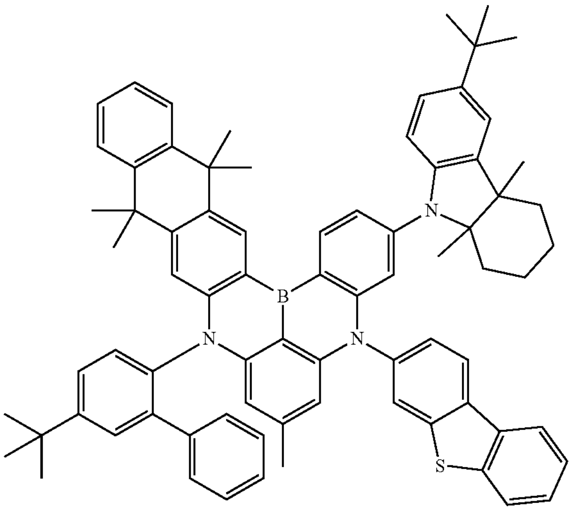

-continued
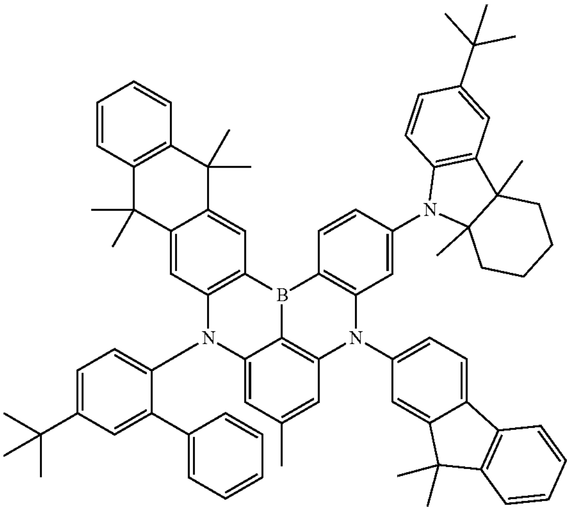
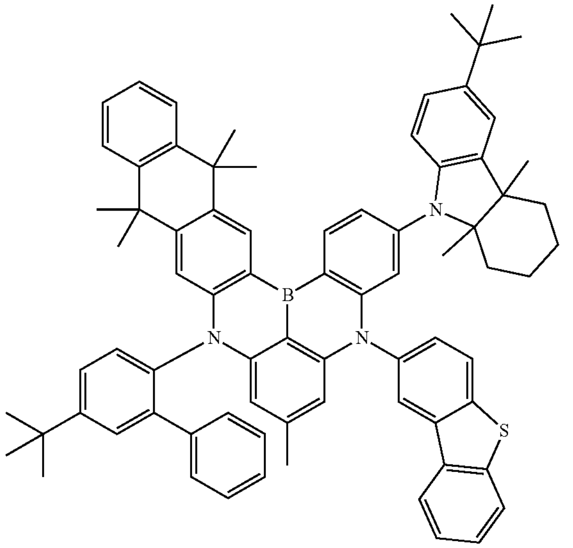
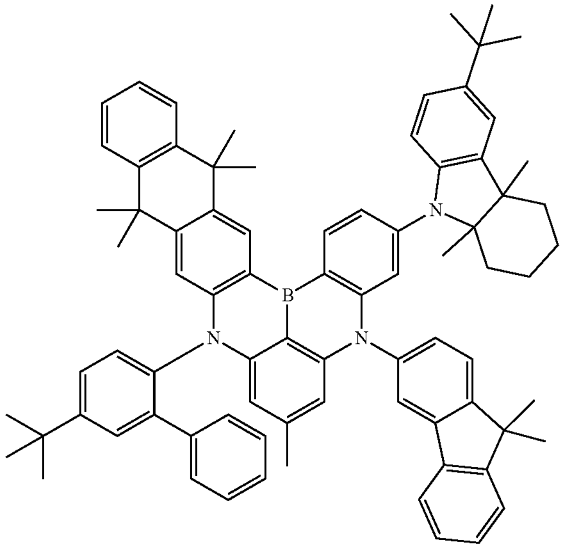
-continued
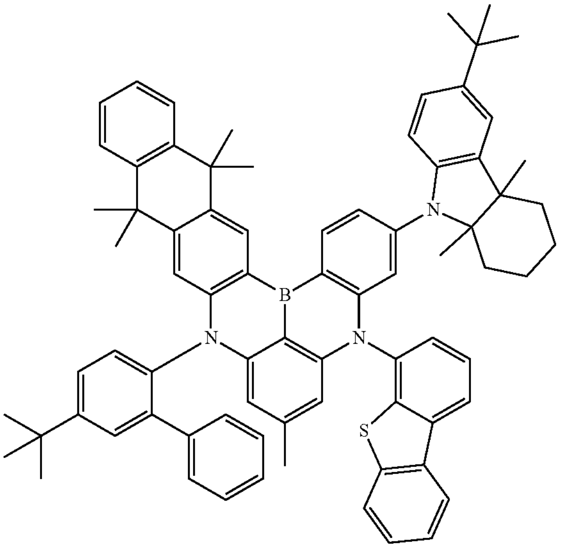
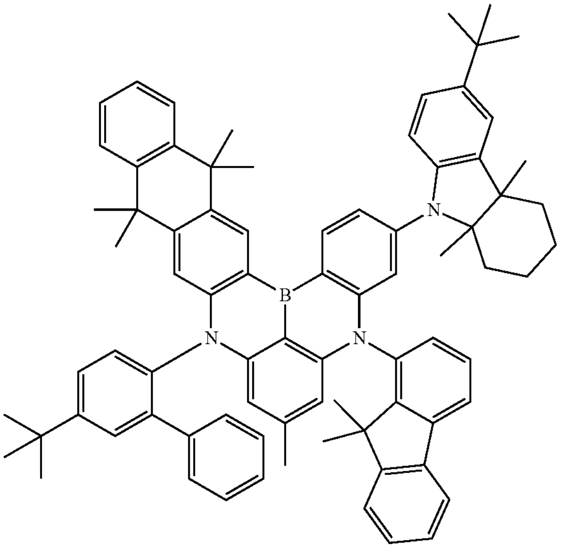
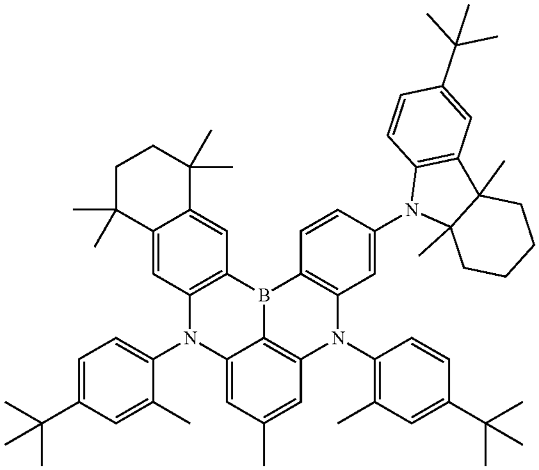

-continued
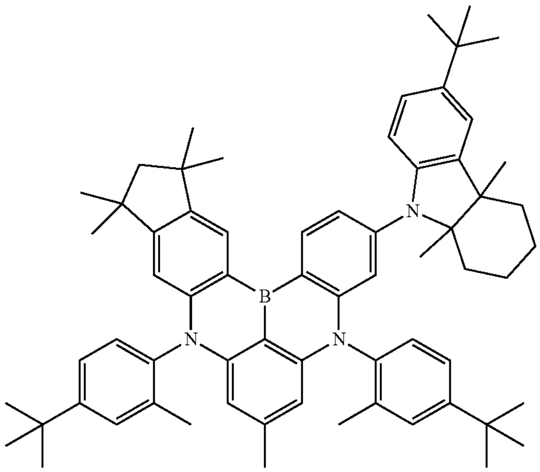
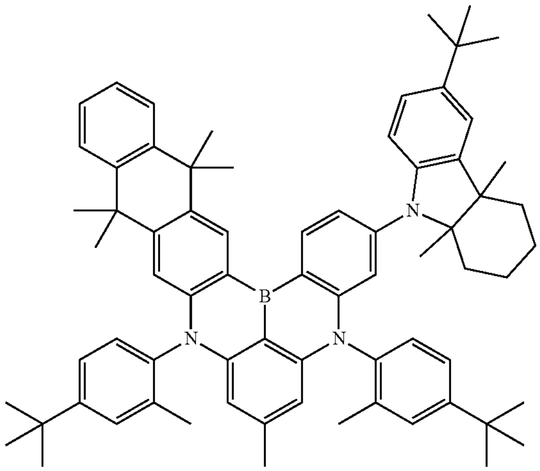
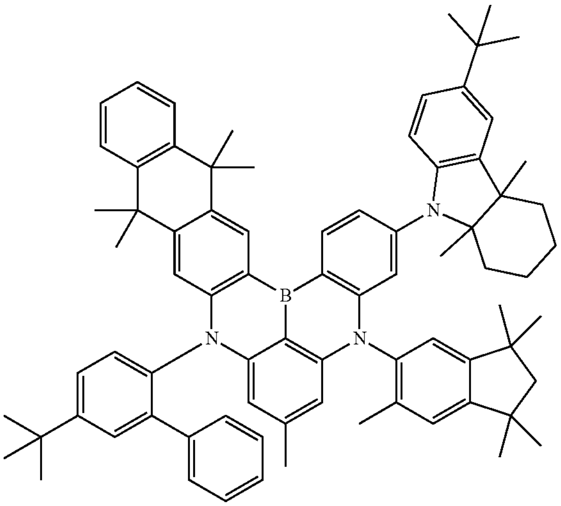
-continued
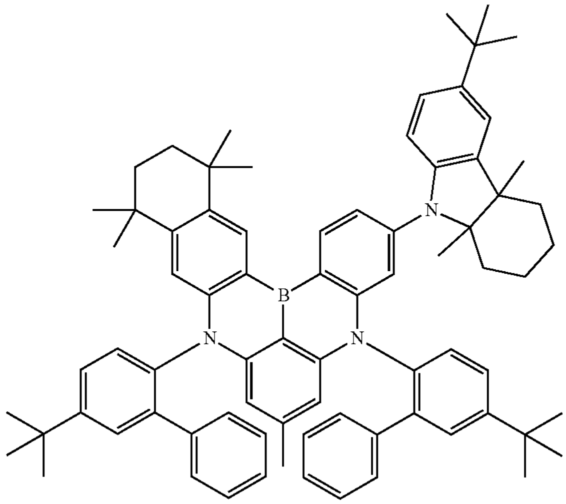
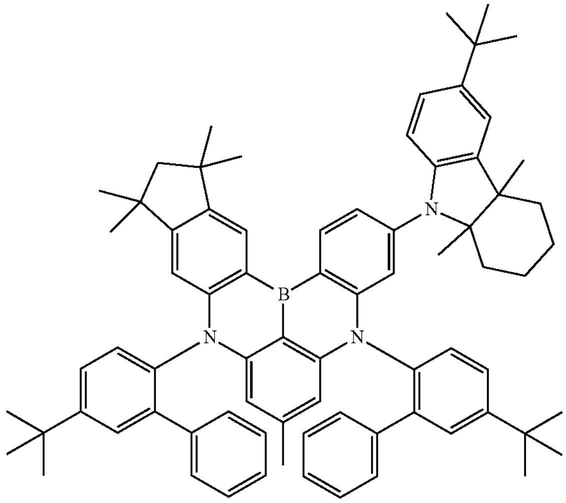
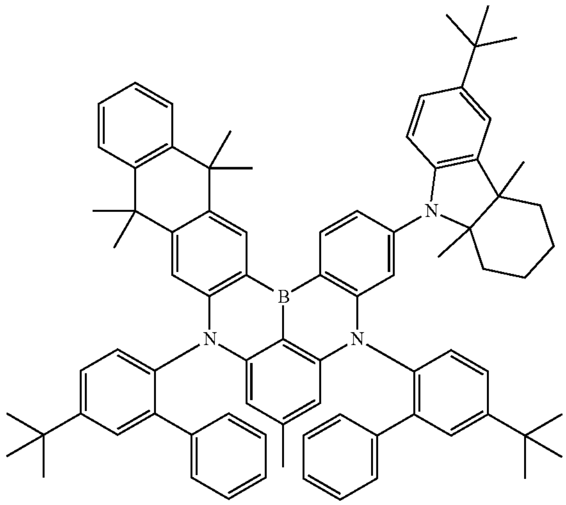

-continued
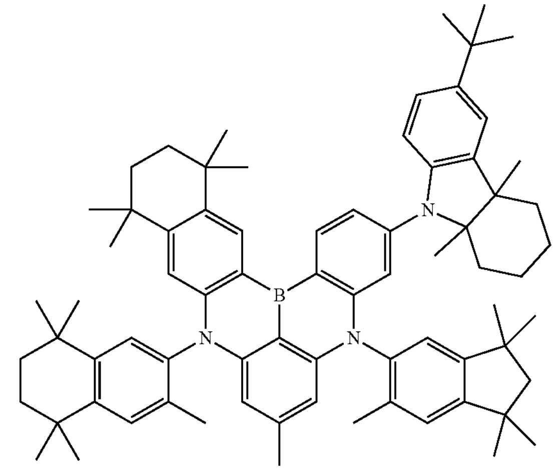
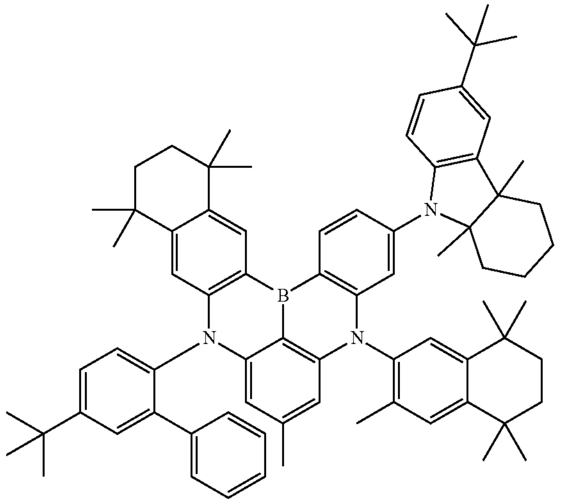
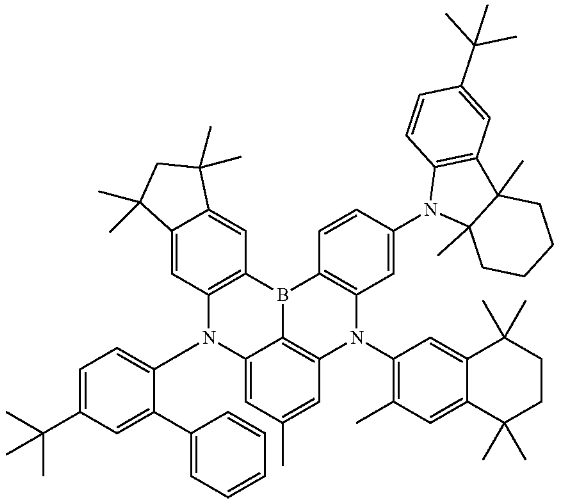
-continued
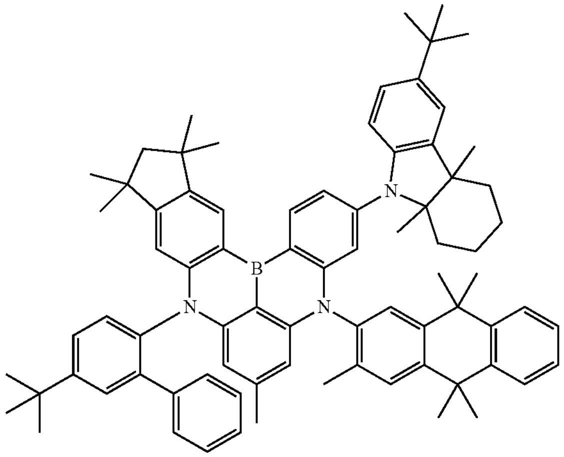
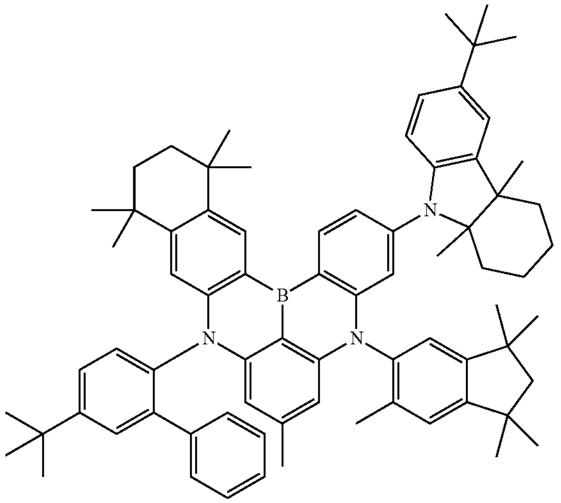
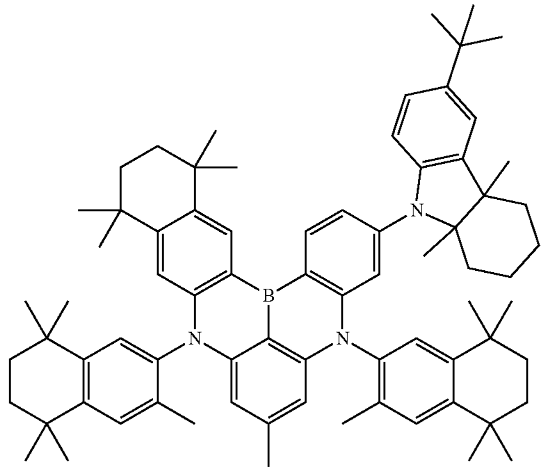

-continued
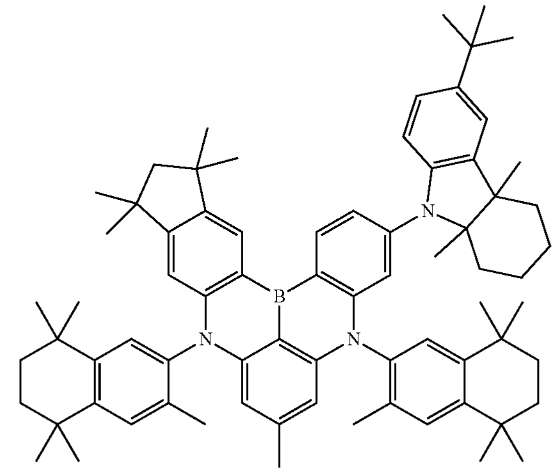
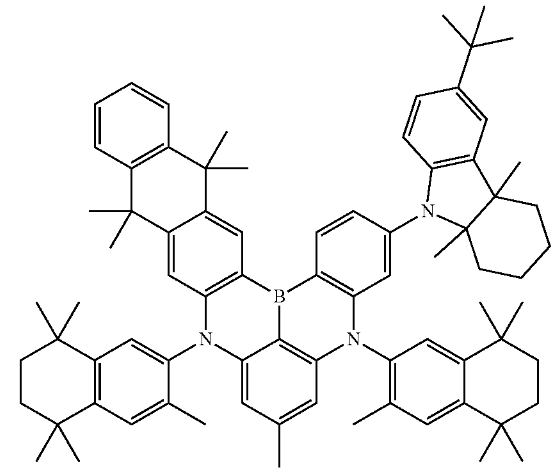
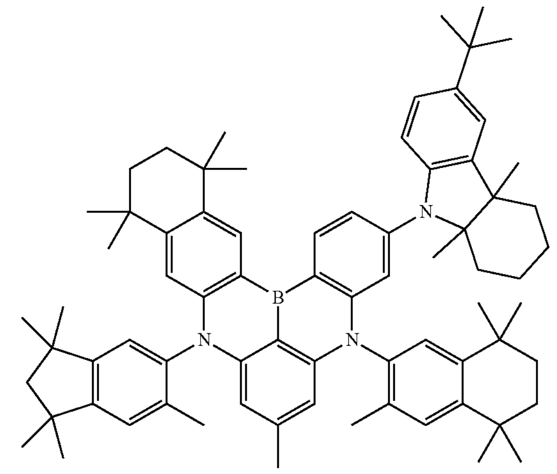
-continued
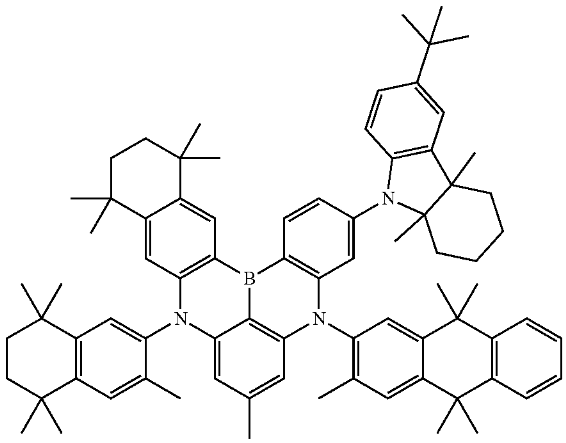
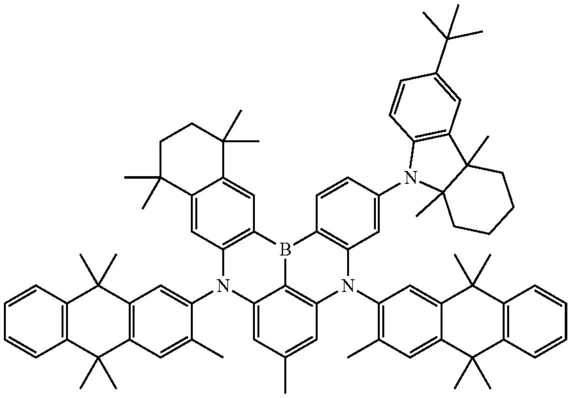
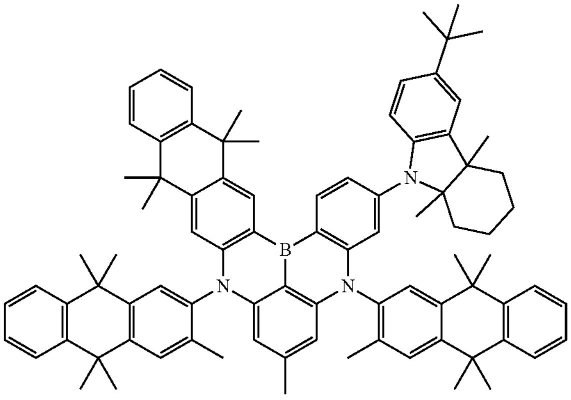
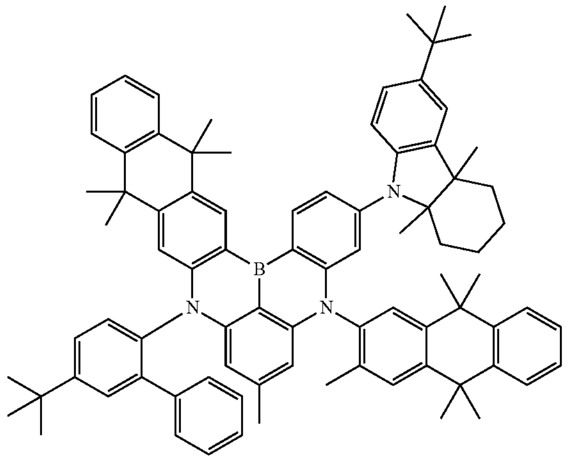

-continued
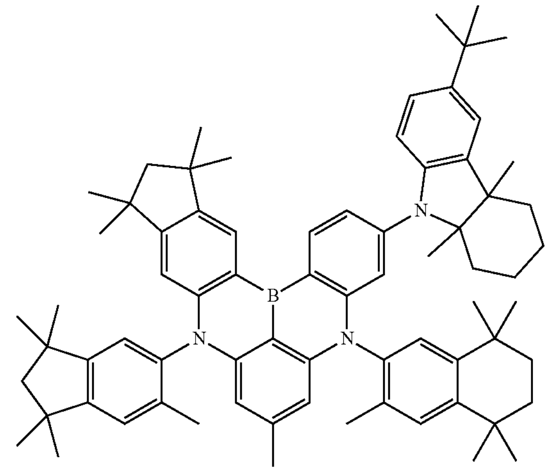
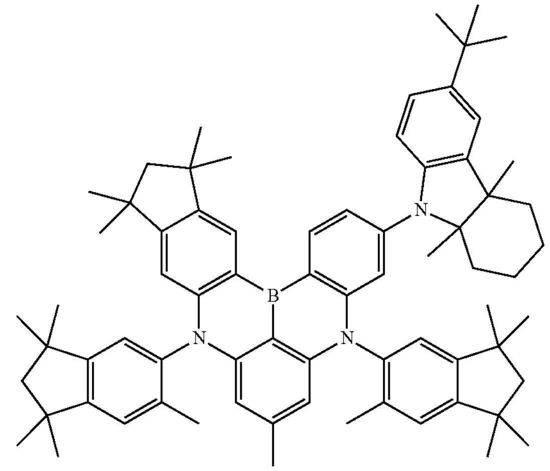
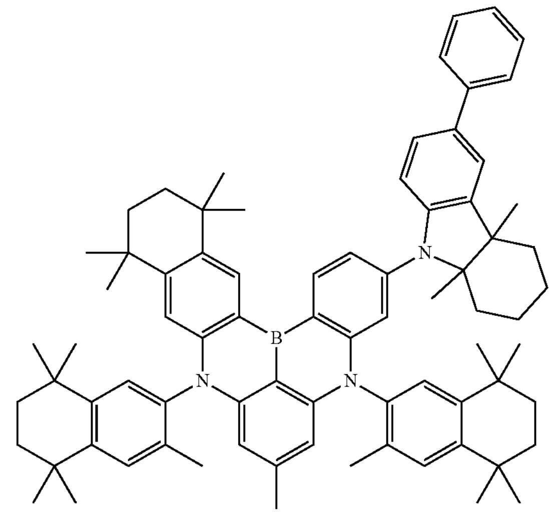
-continued
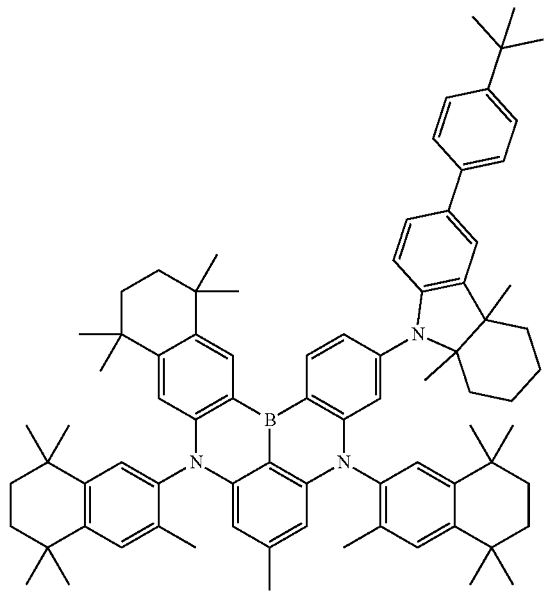
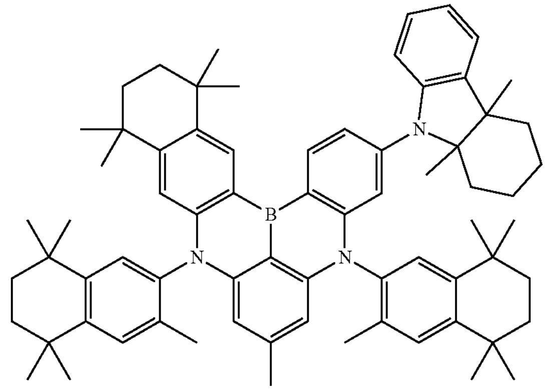
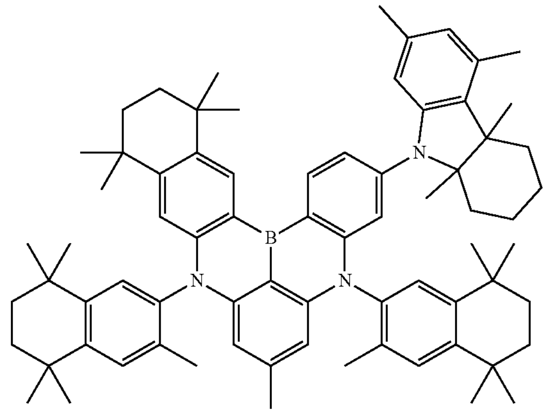

-continued
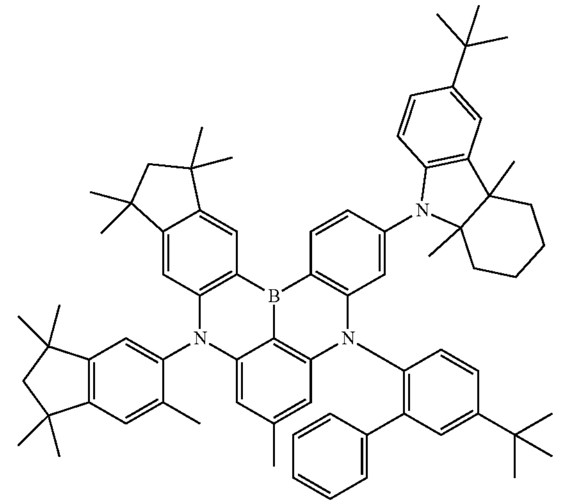
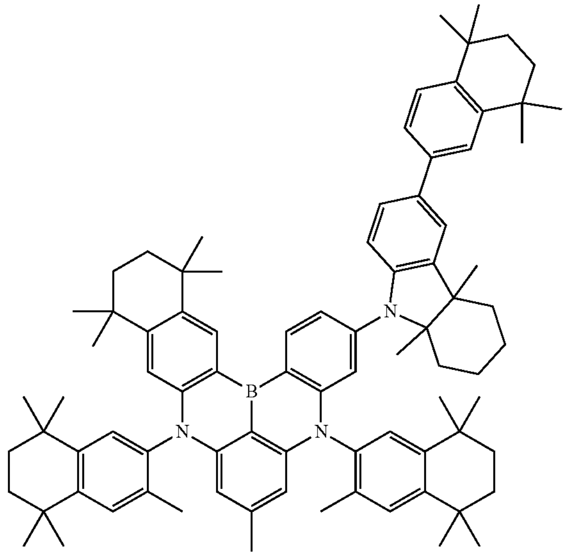
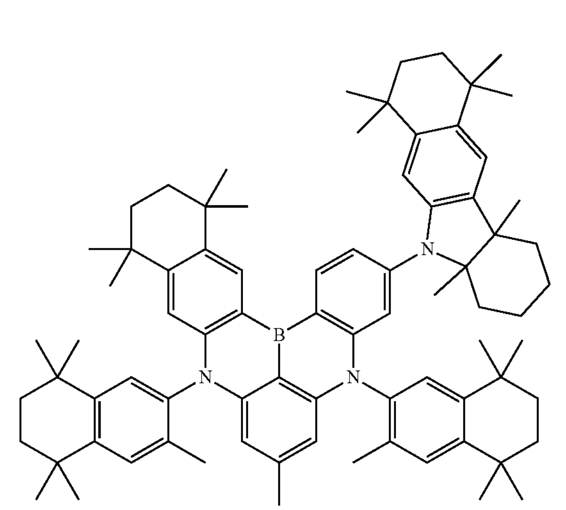
-continued
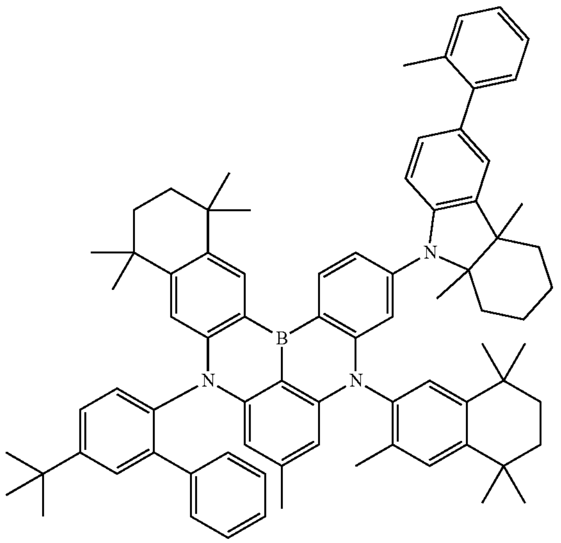
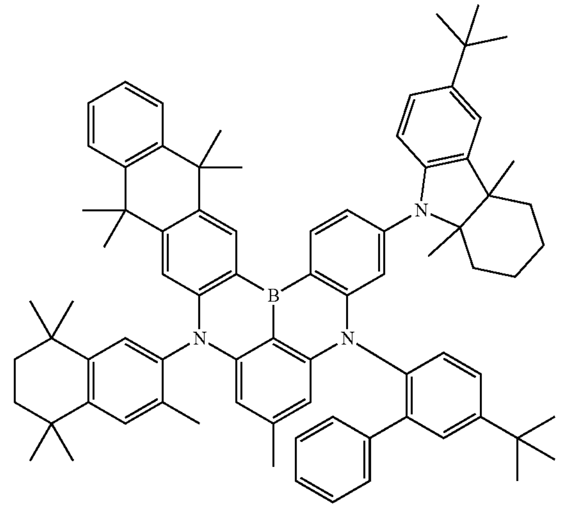
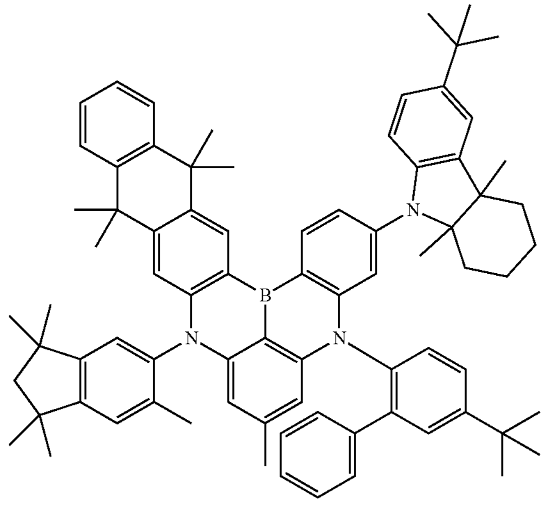

-continued
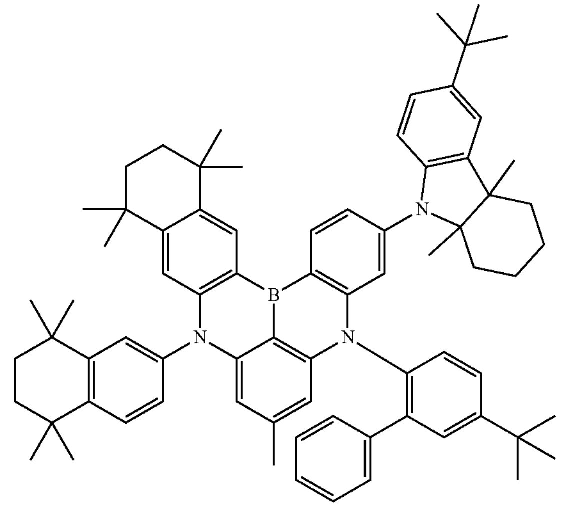
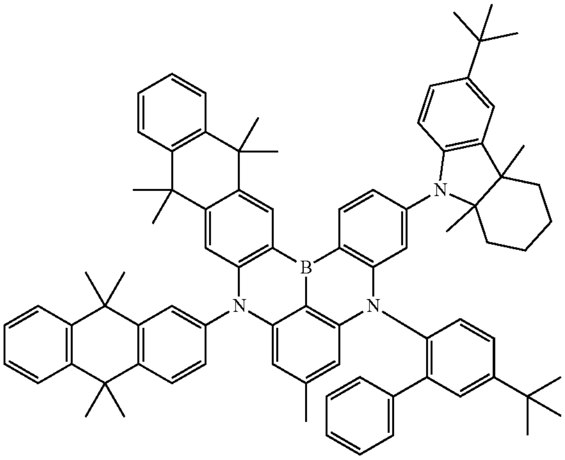
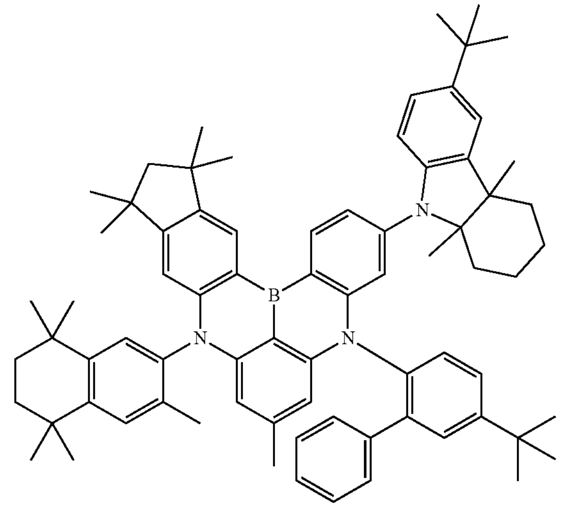
-continued
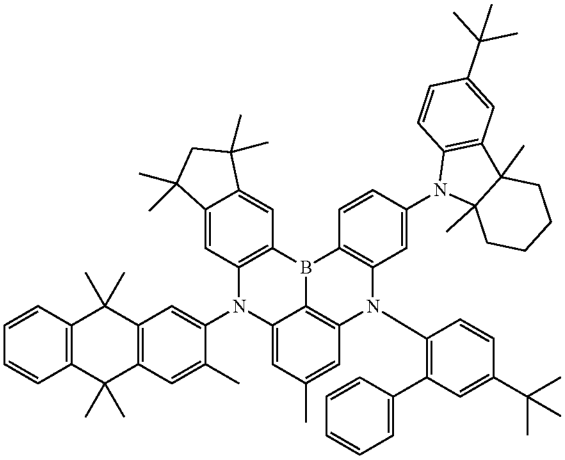
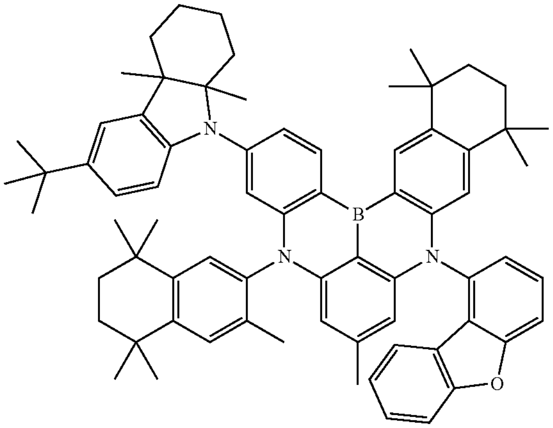
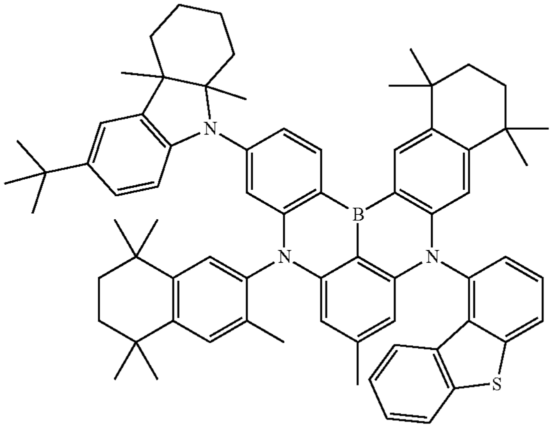

-continued
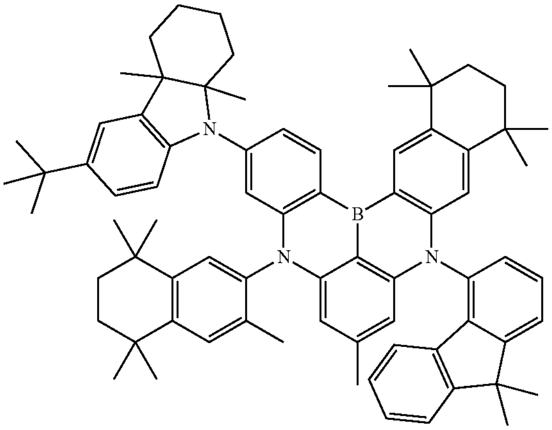
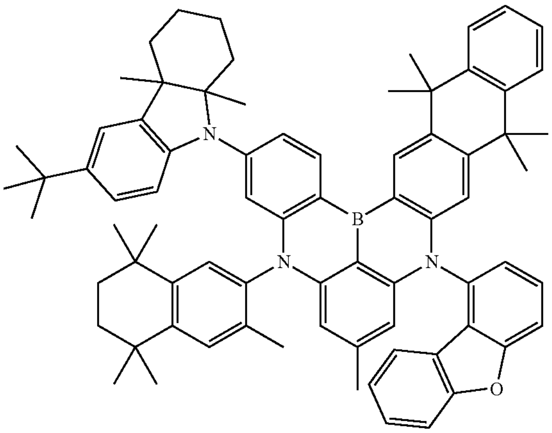
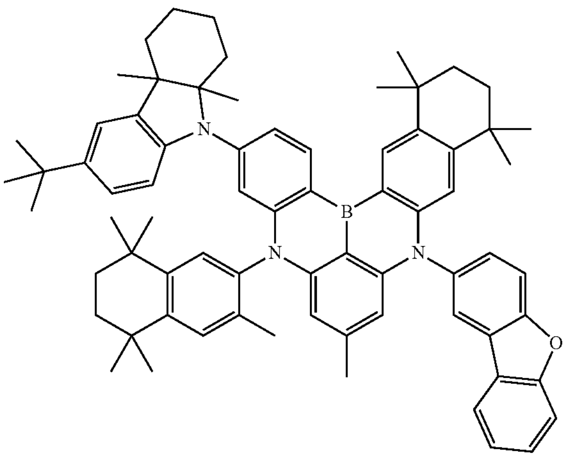
-continued
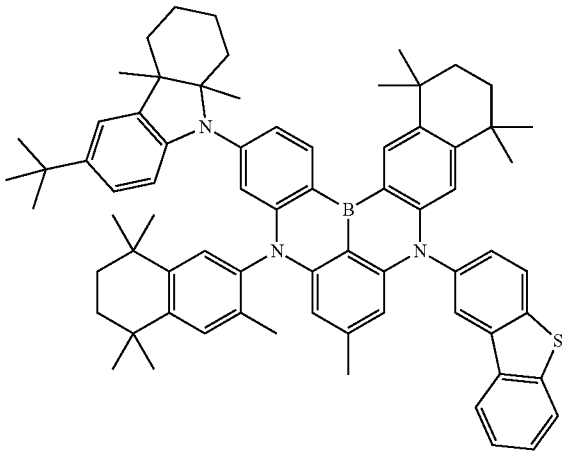
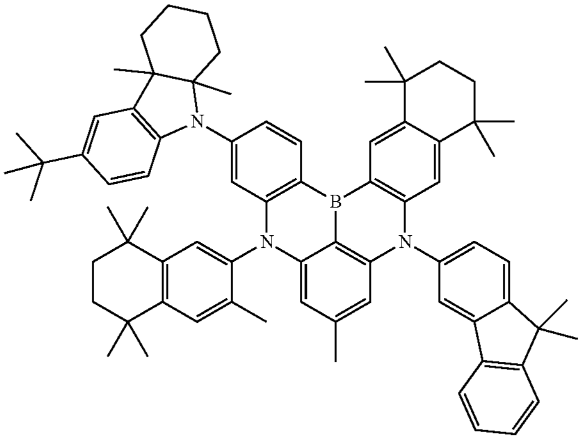
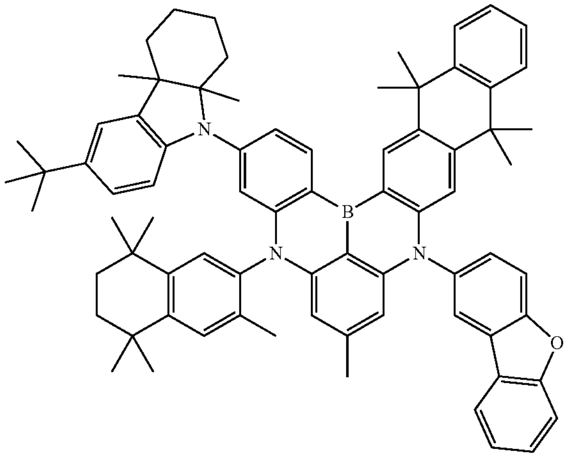
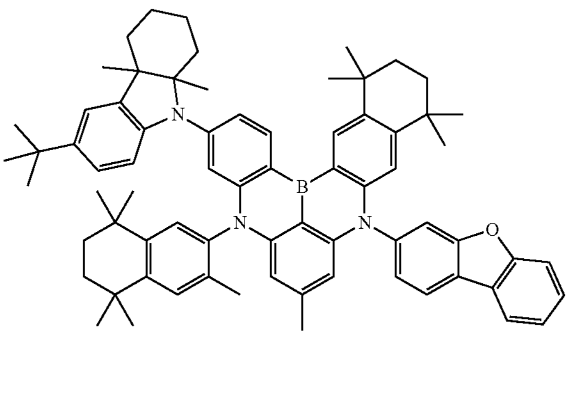

-continued
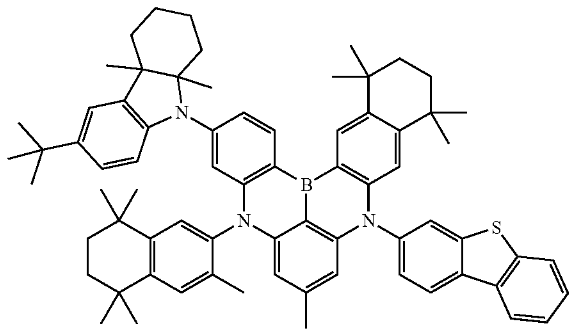
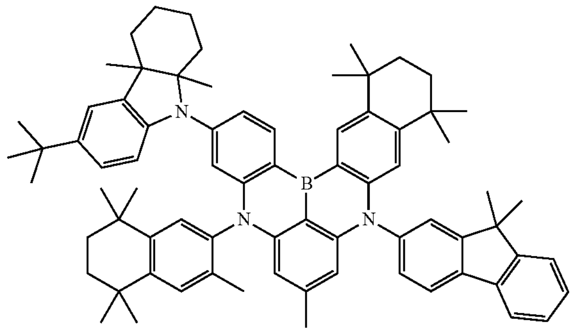
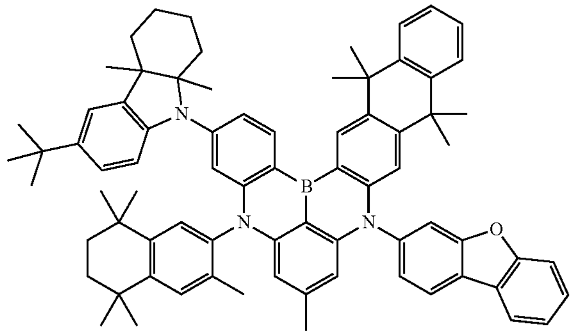
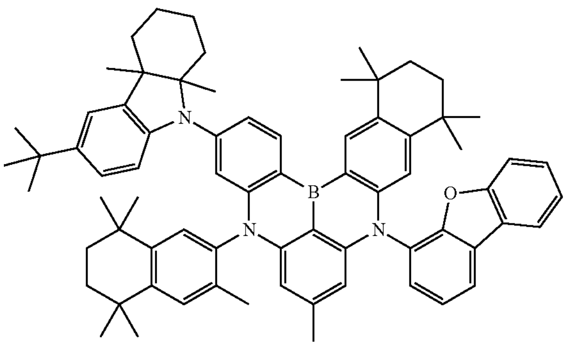
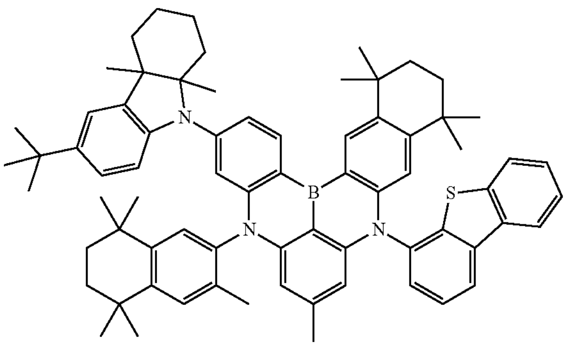
-continued
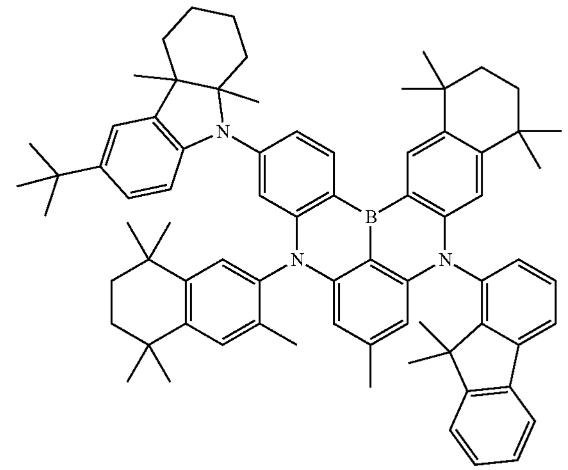
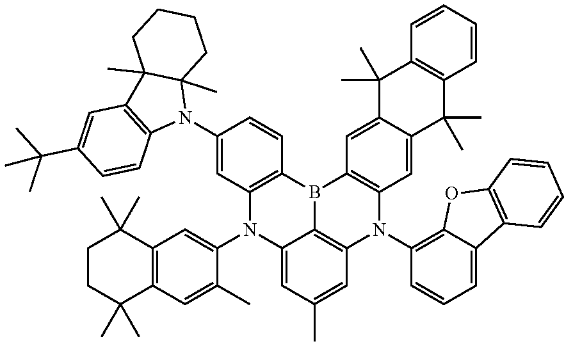
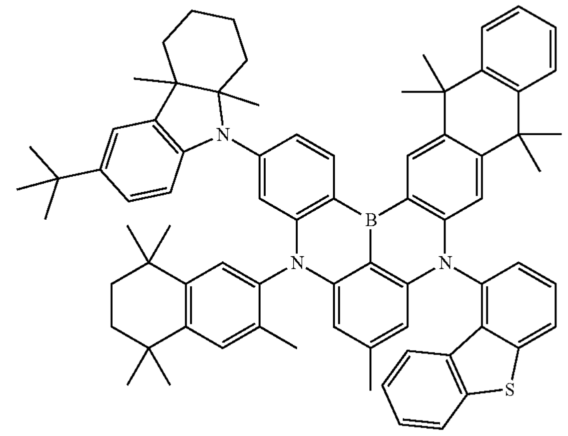
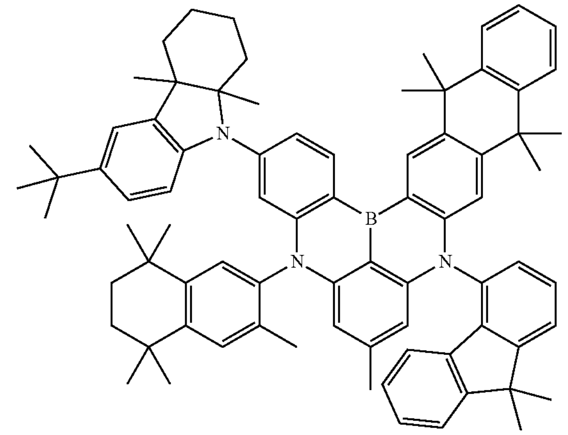

-continued
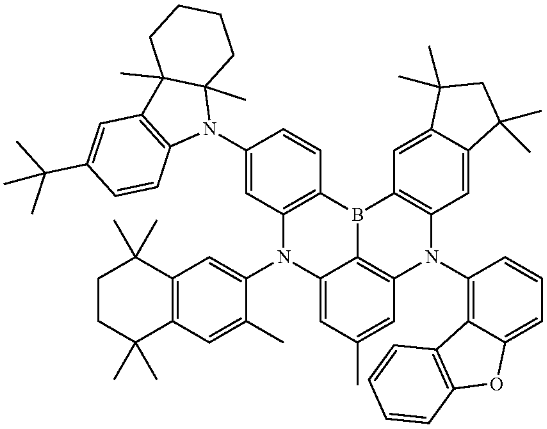
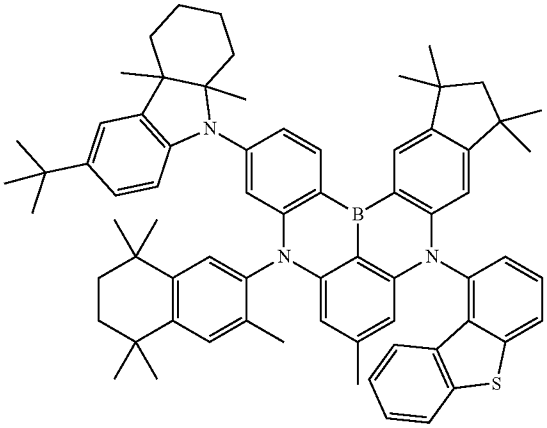
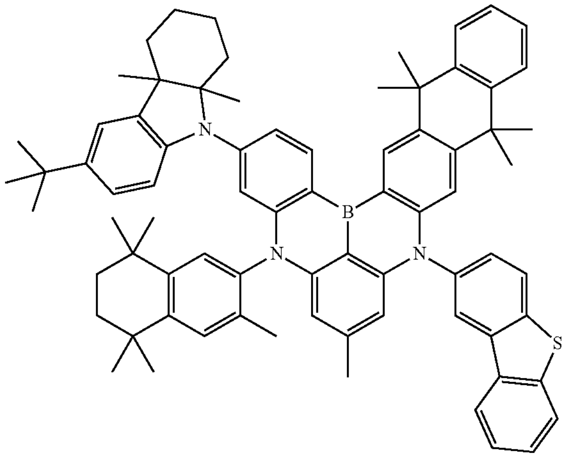
-continued
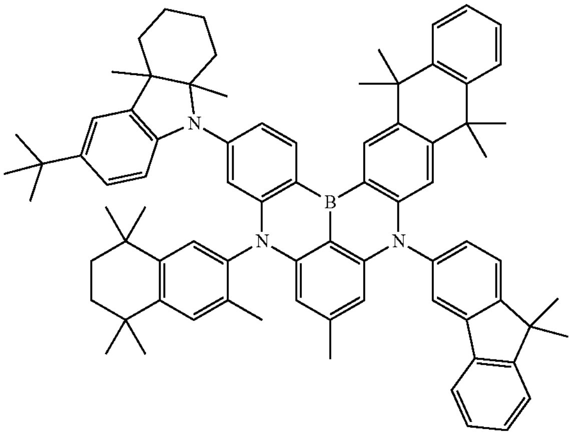
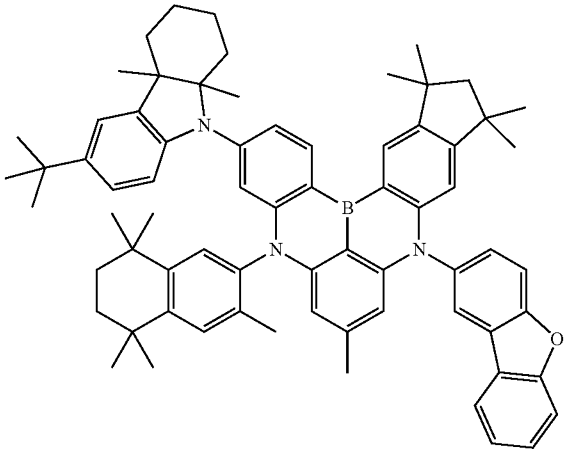
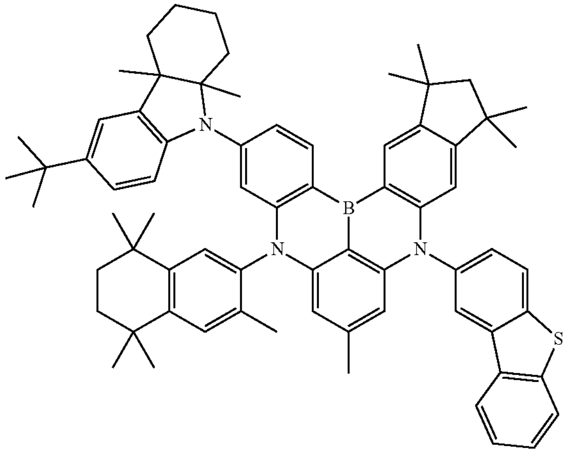
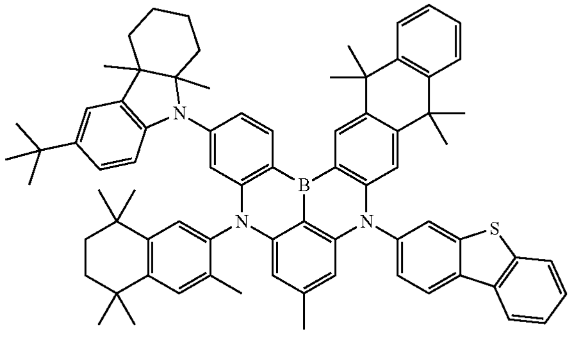

-continued
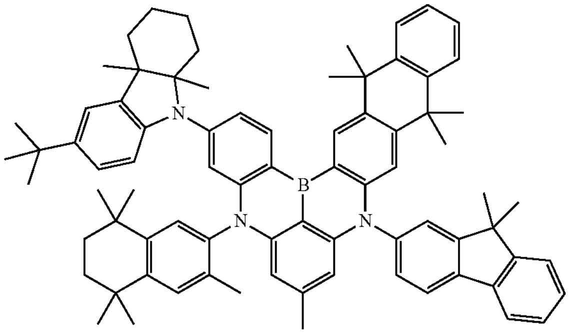
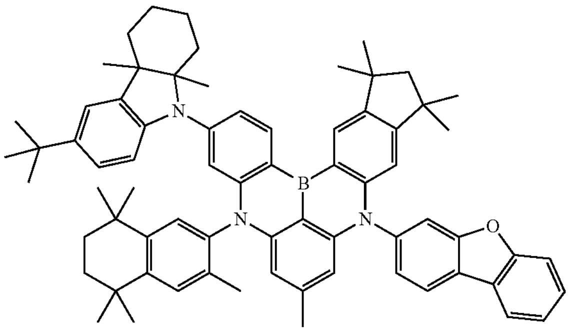
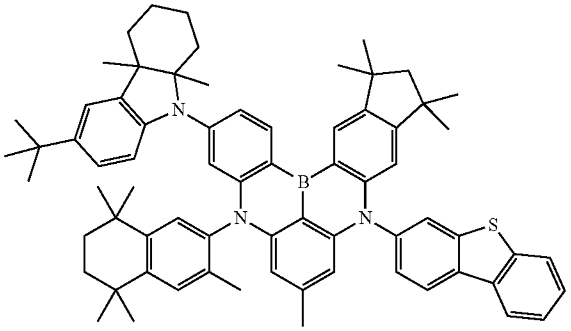
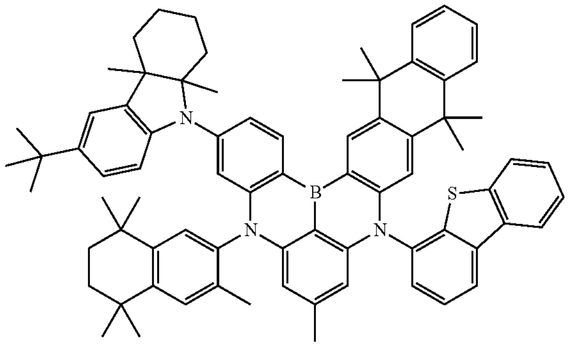
-continued
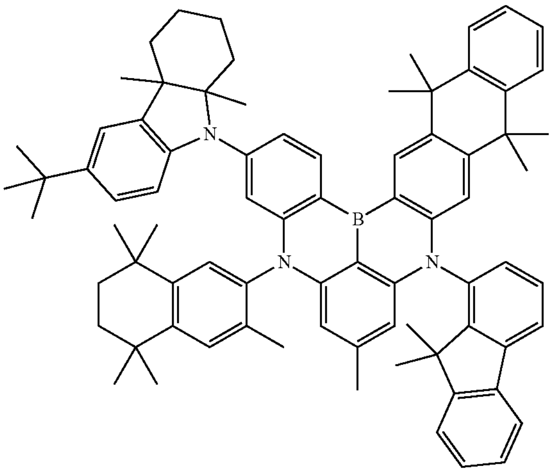
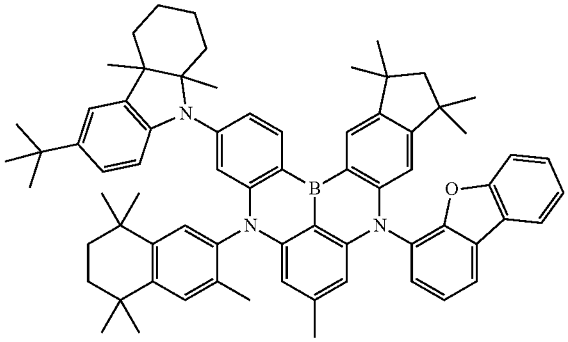
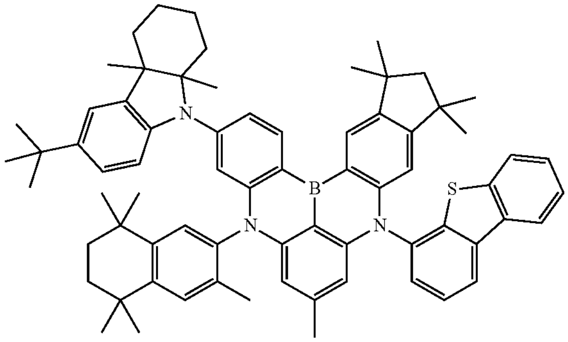
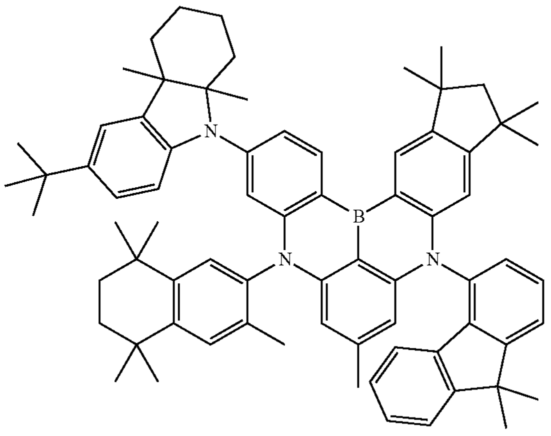

-continued
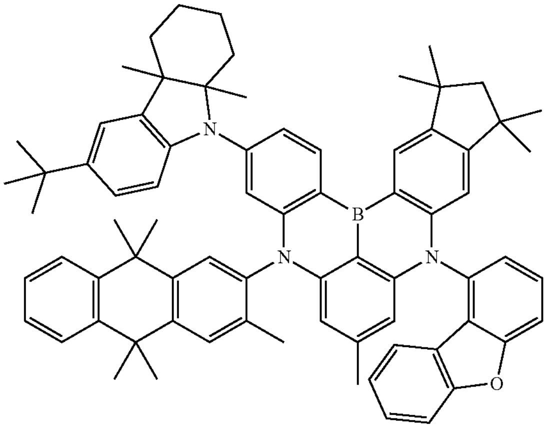
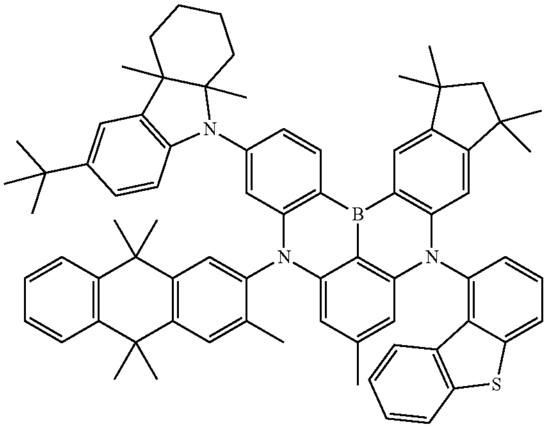
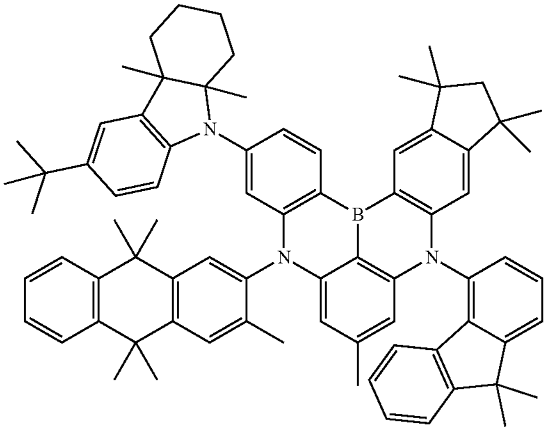
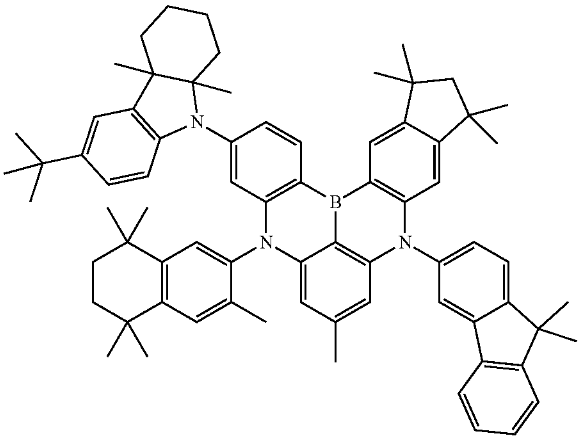
-continued
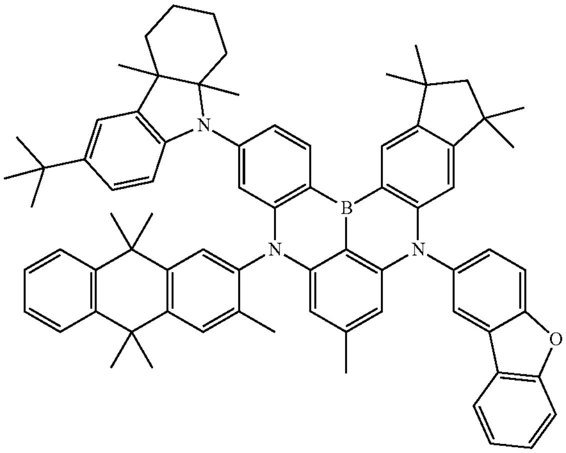
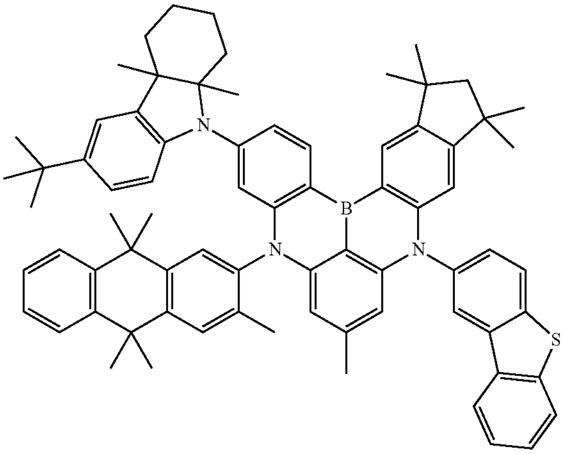
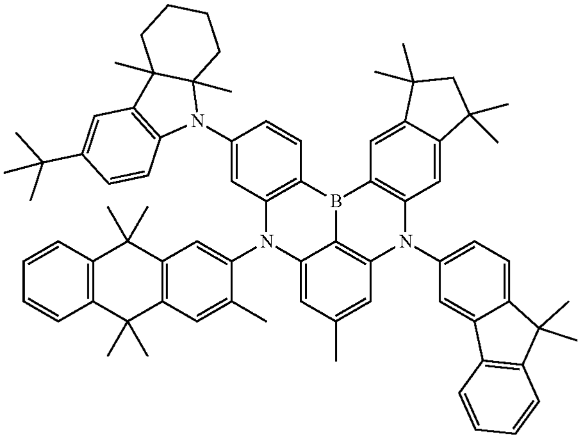
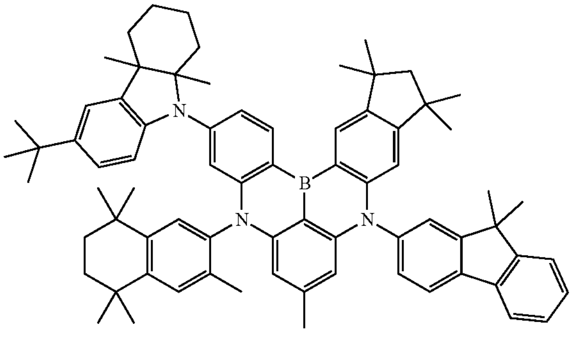

-continued
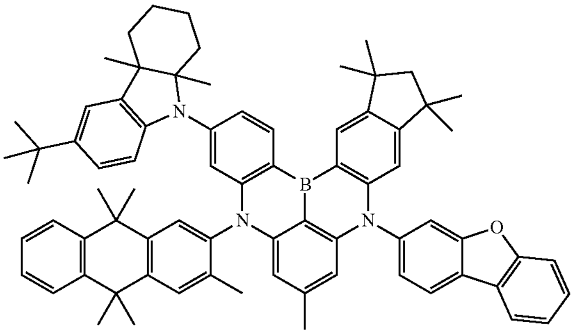
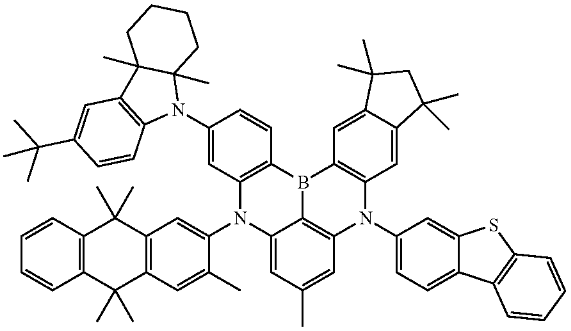
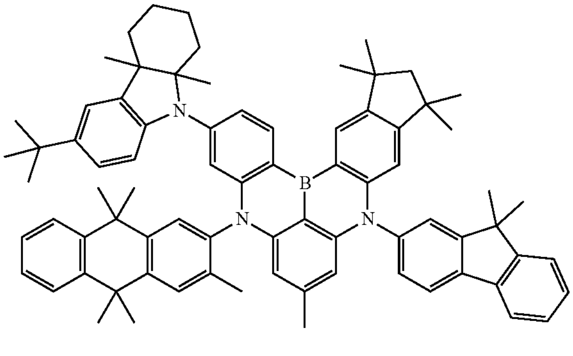
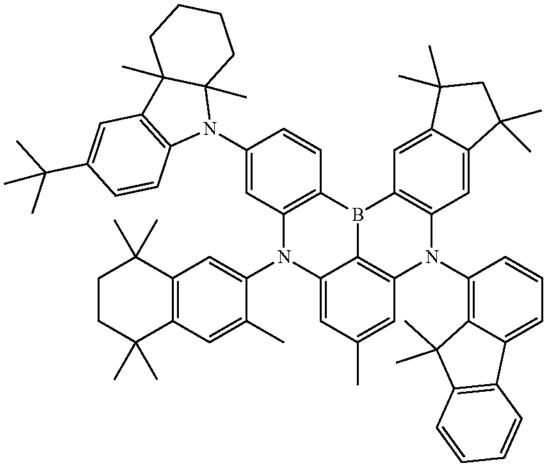
-continued
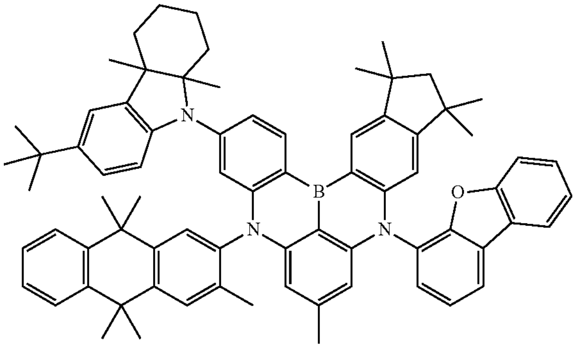
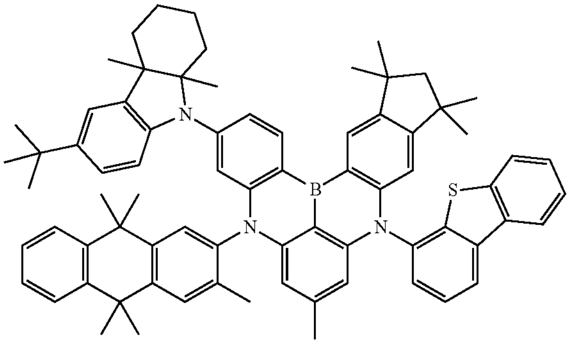
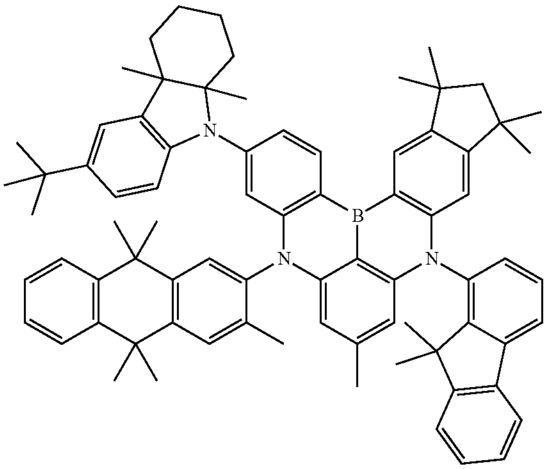
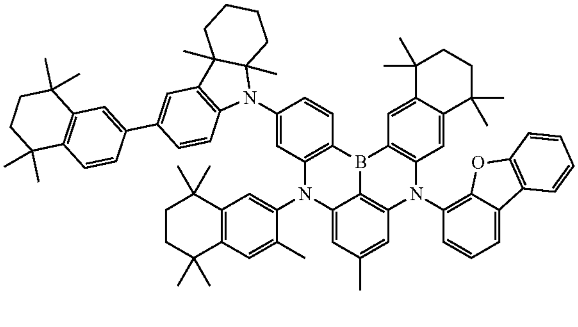

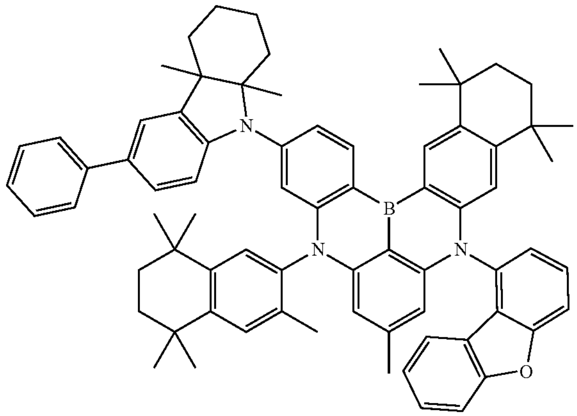
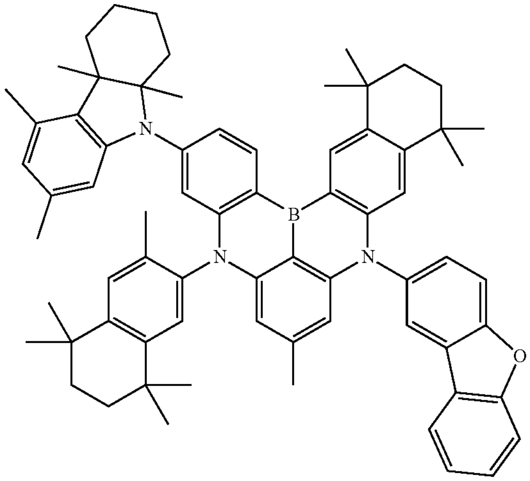
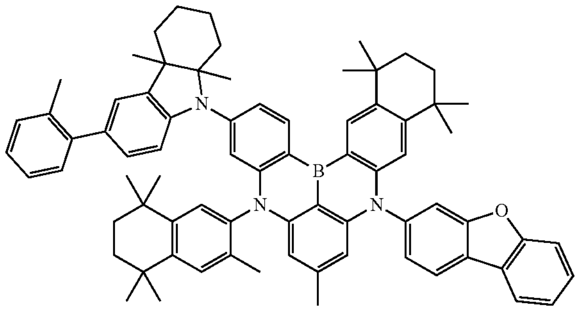
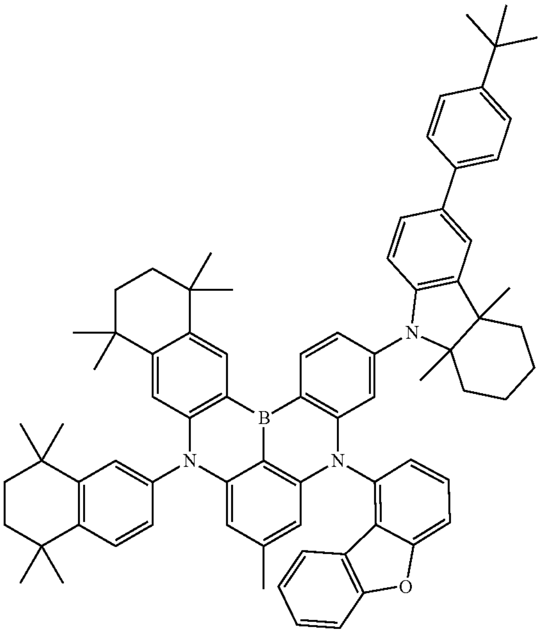
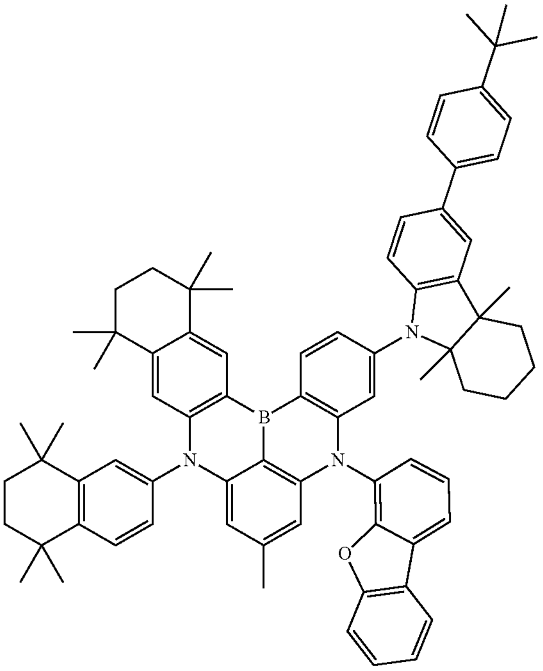

-continued
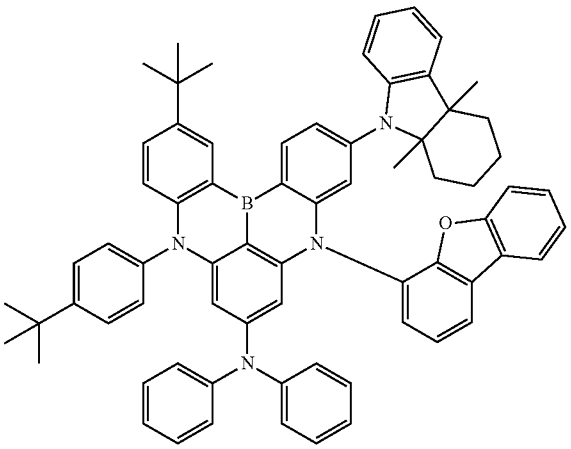
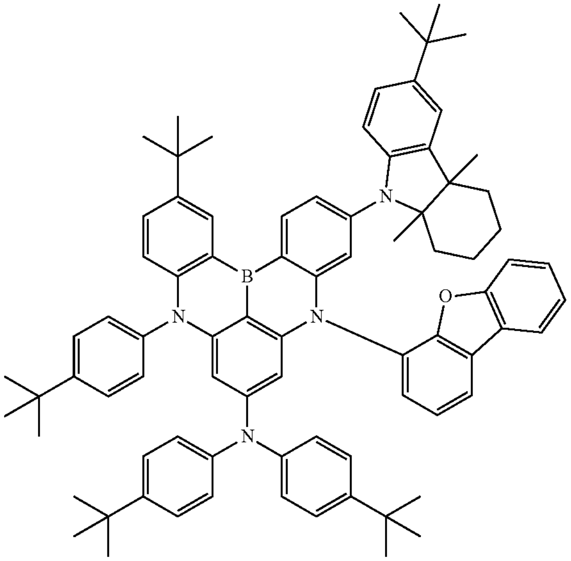
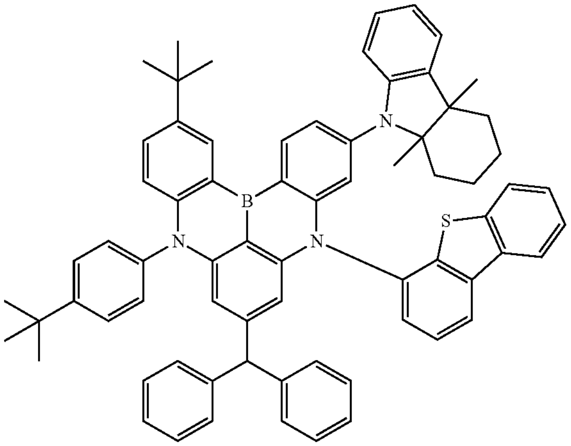
-continued
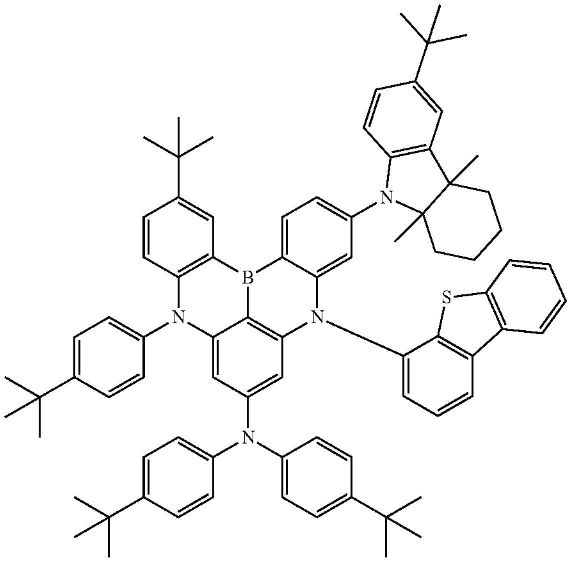
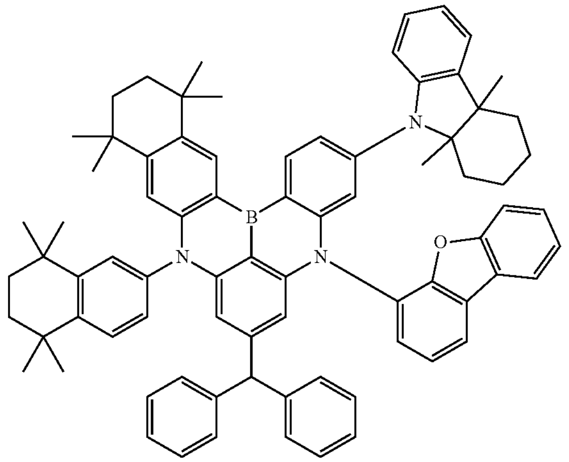
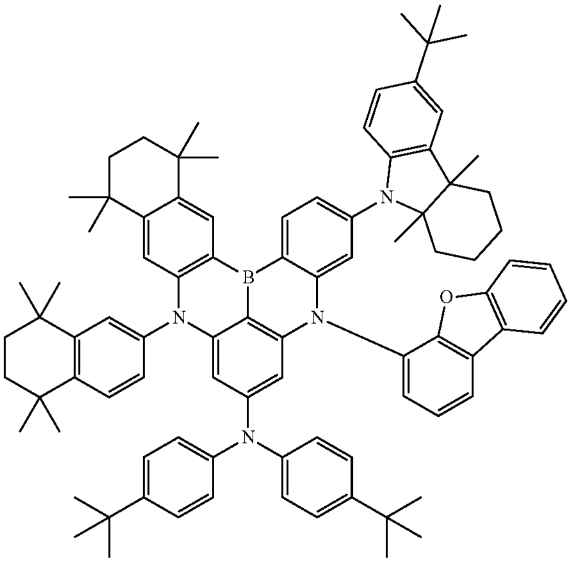

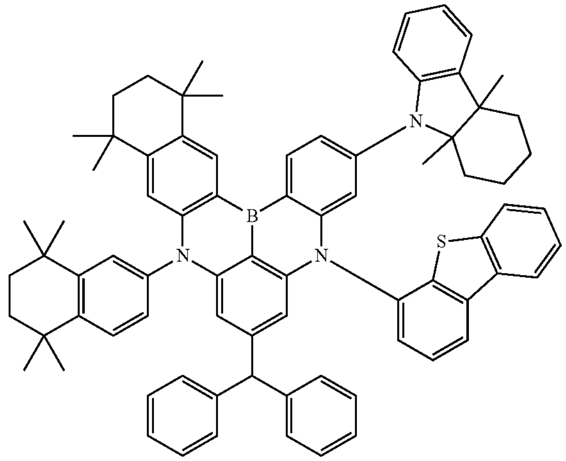
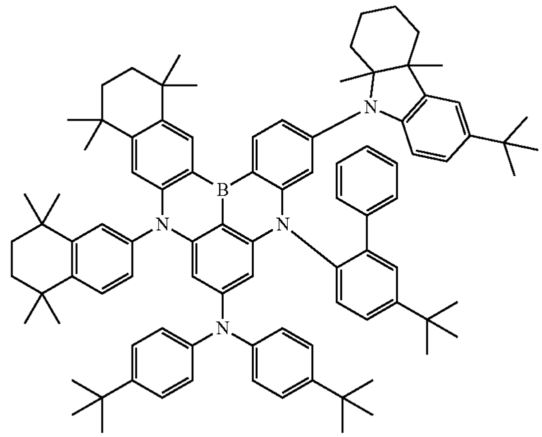
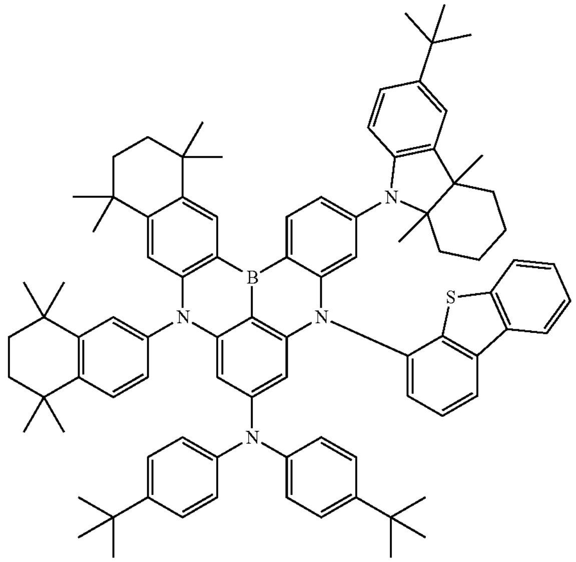
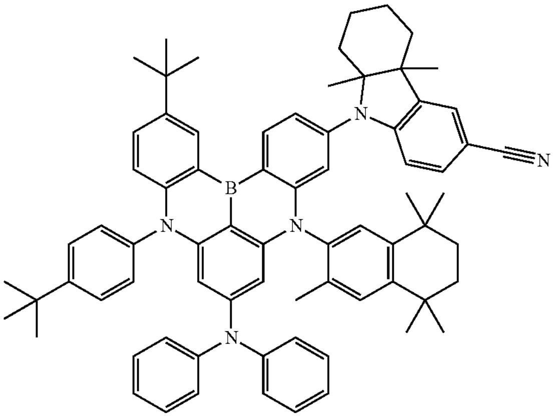
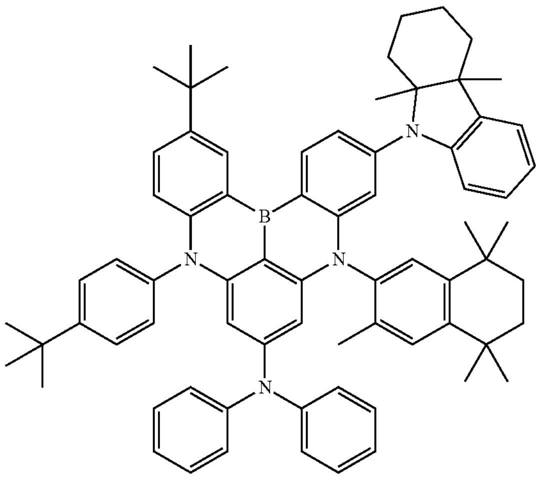
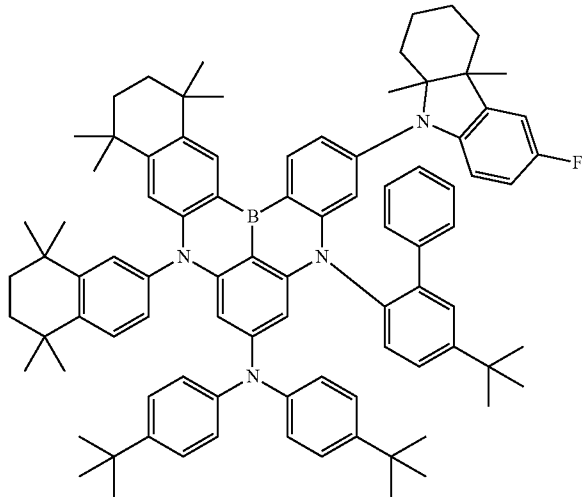

-continued
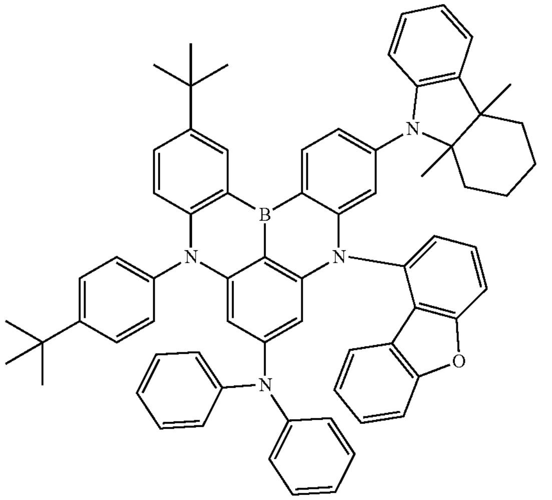
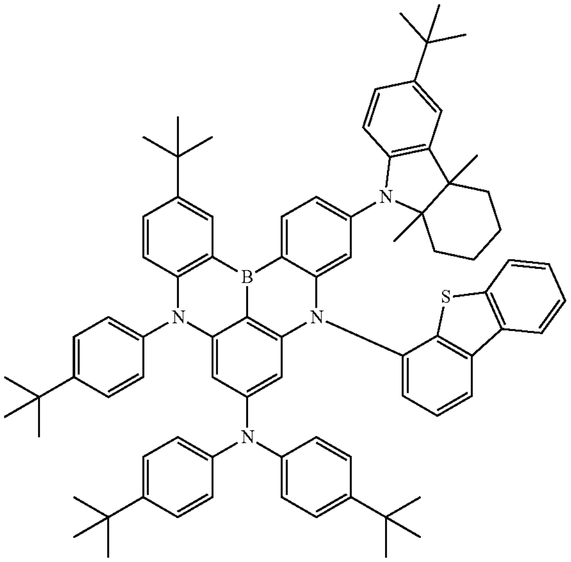
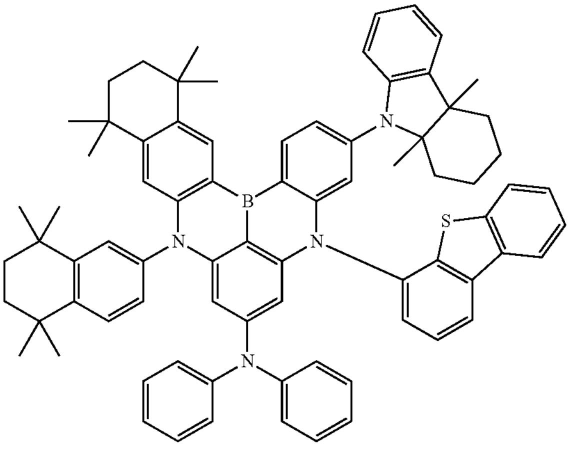
-continued
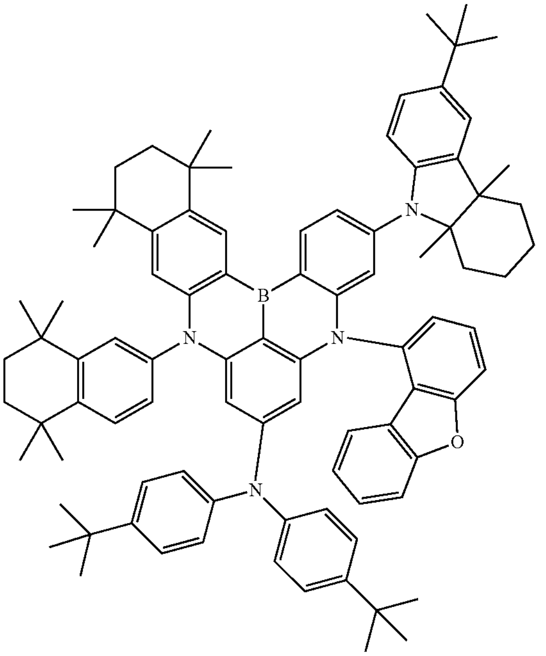
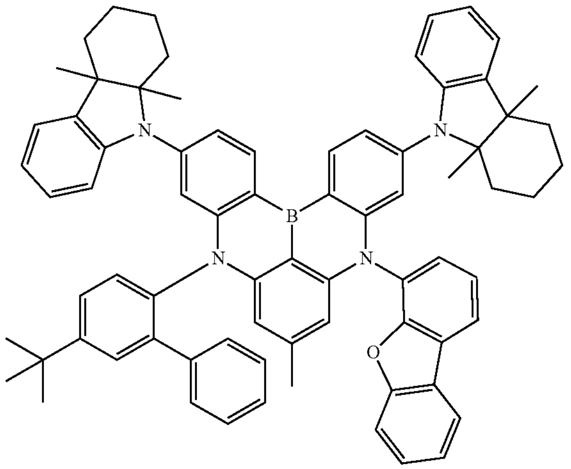
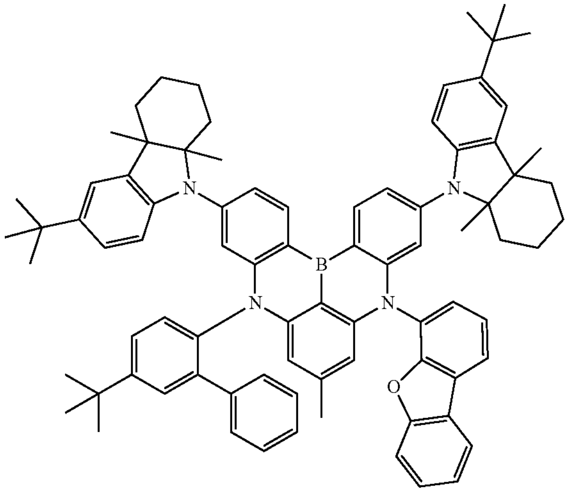

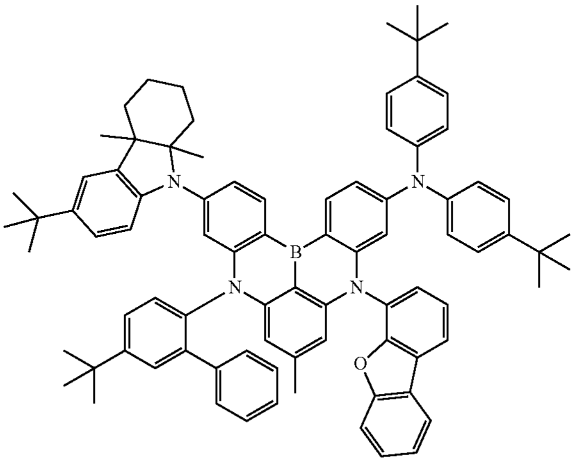
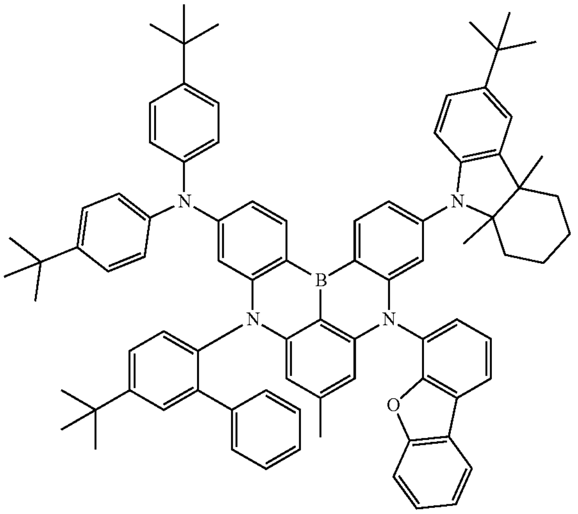
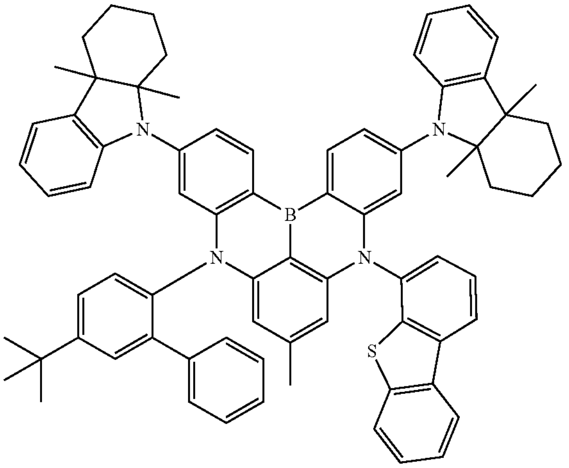
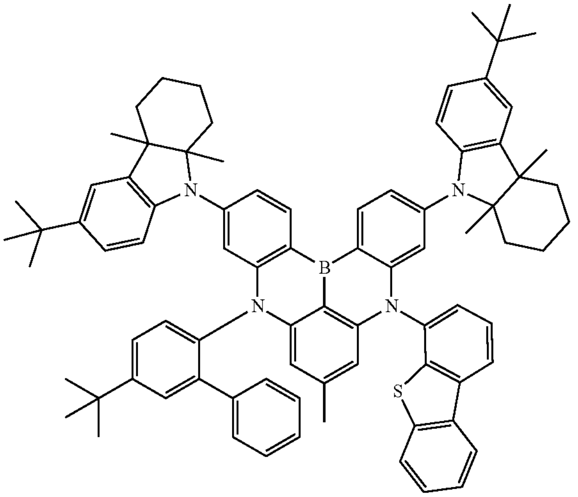
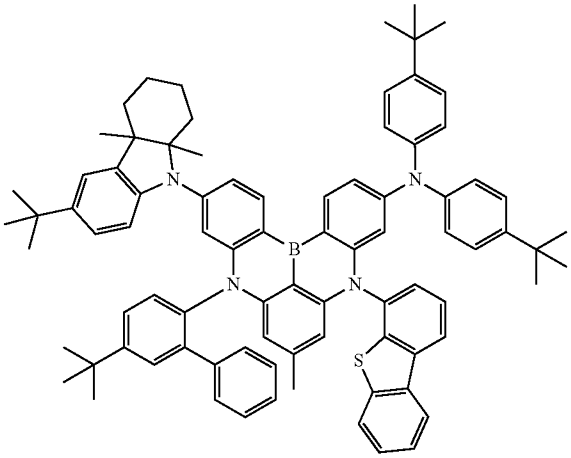
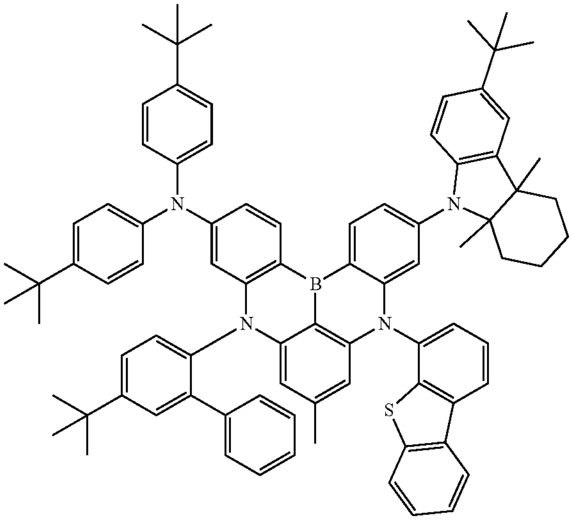

-continued
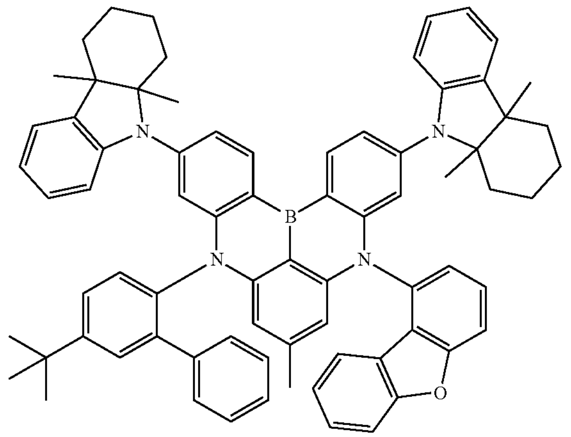
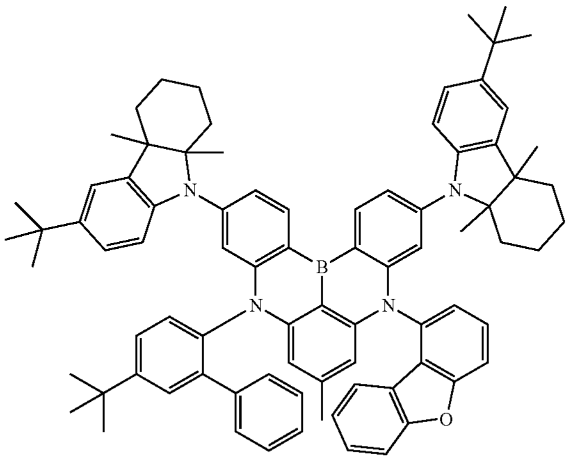
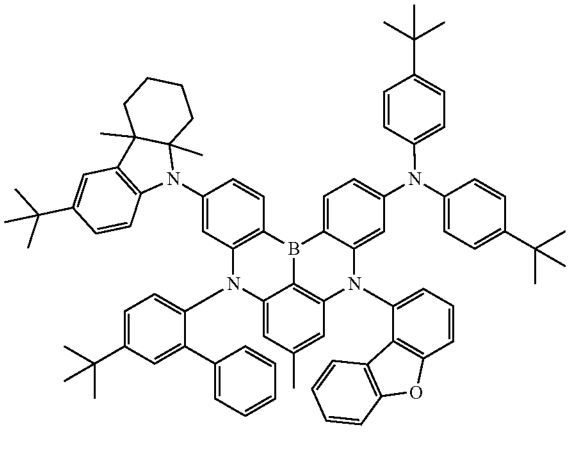
-continued
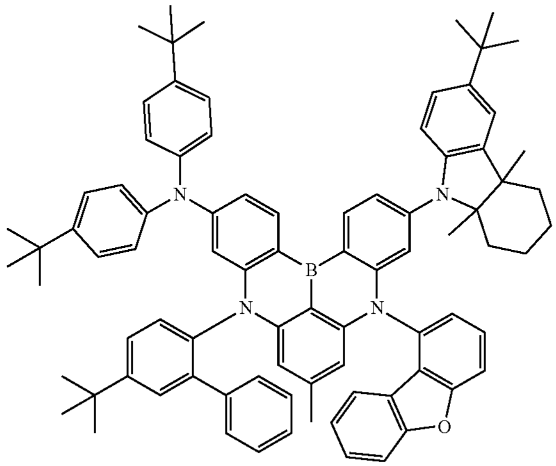
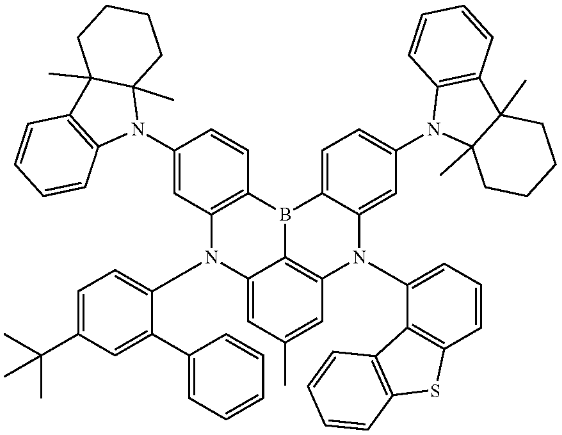
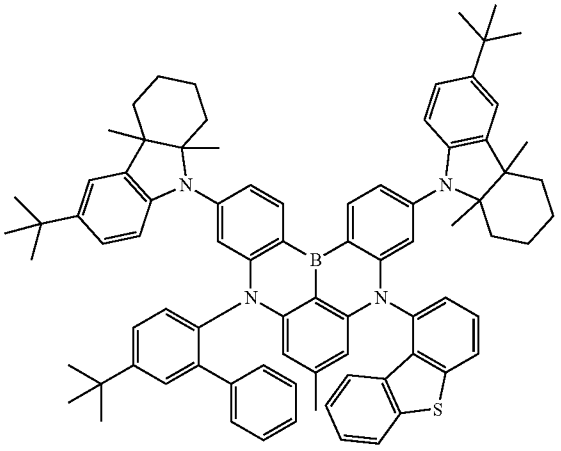

-continued
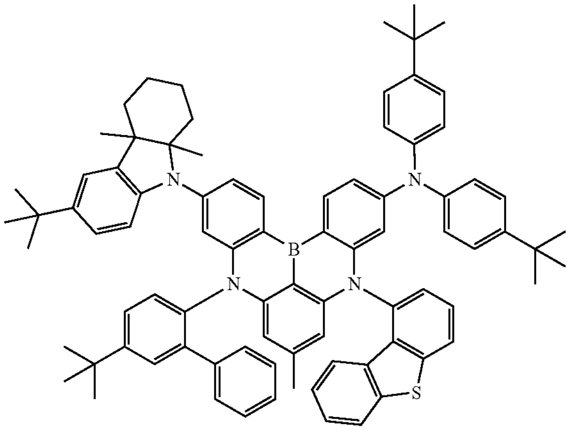
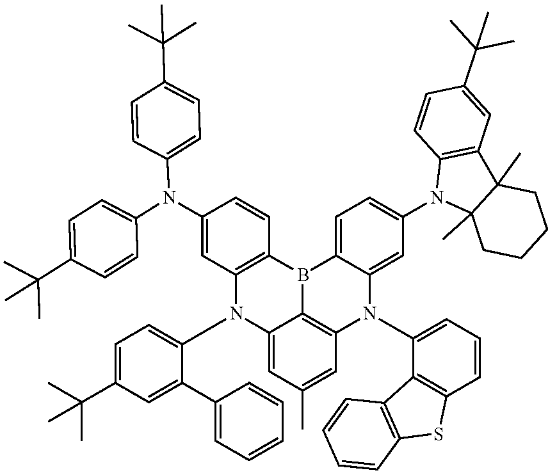
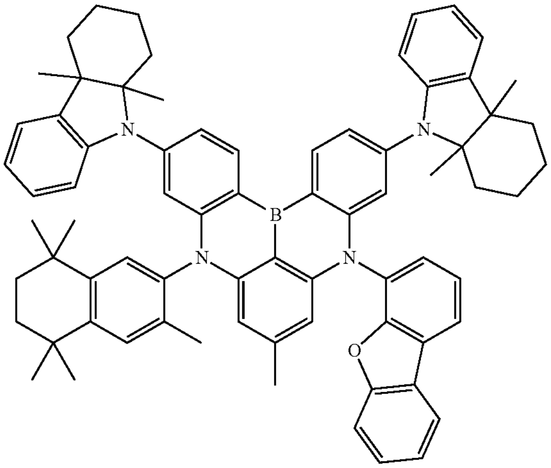
-continued
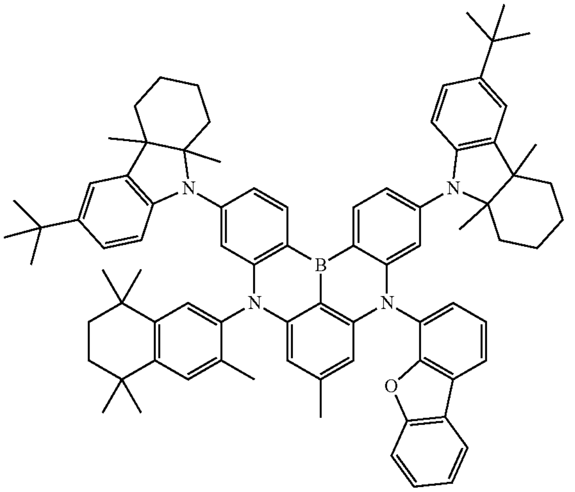
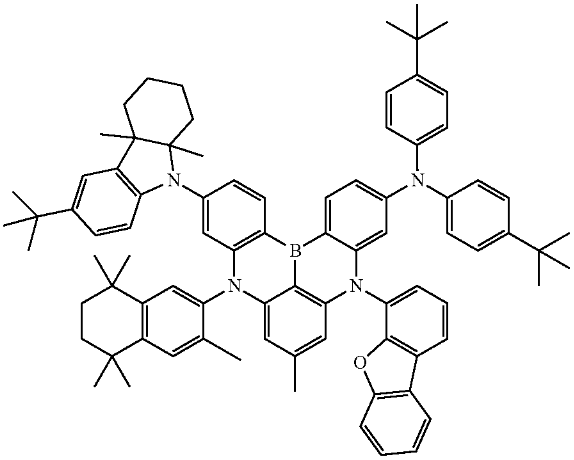
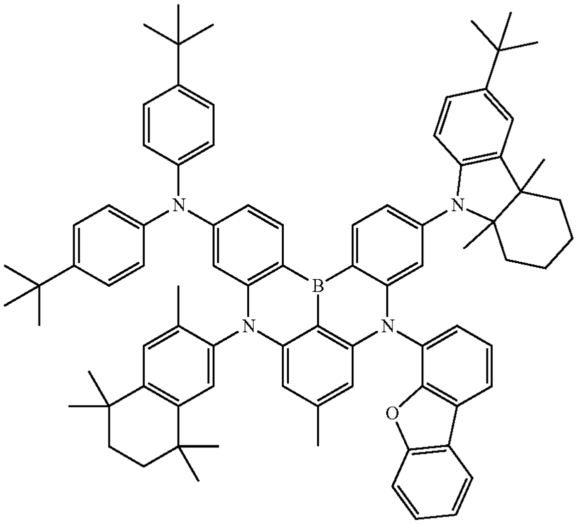

-continued
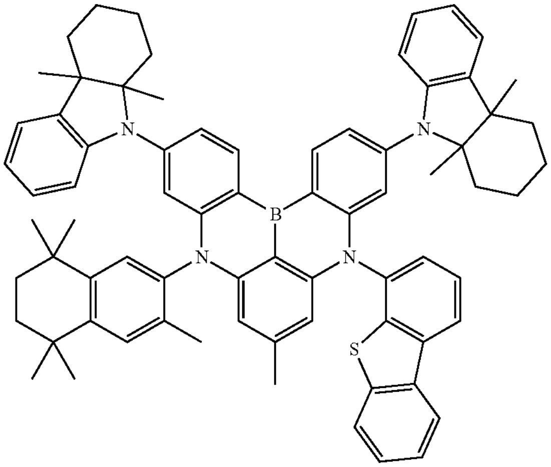
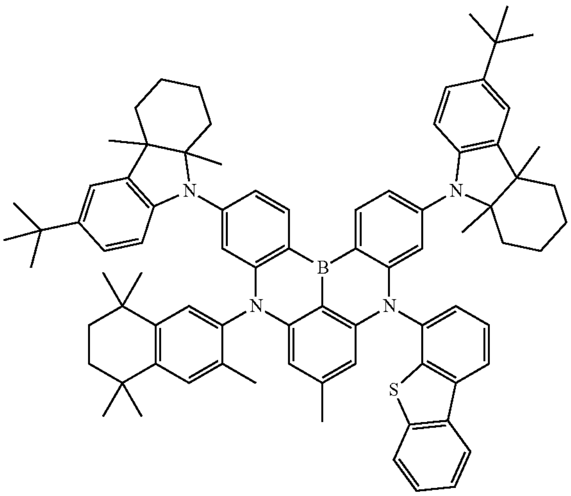
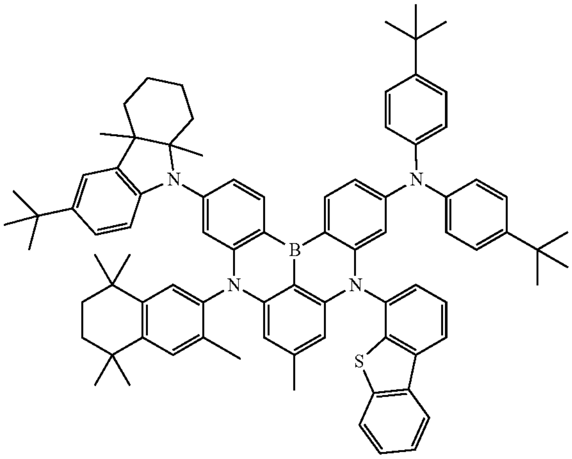
-continued
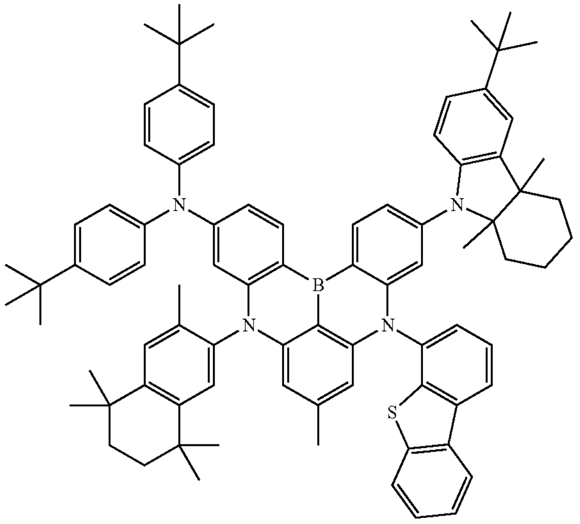
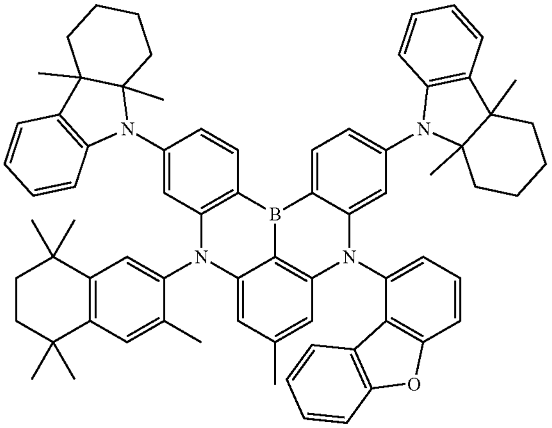
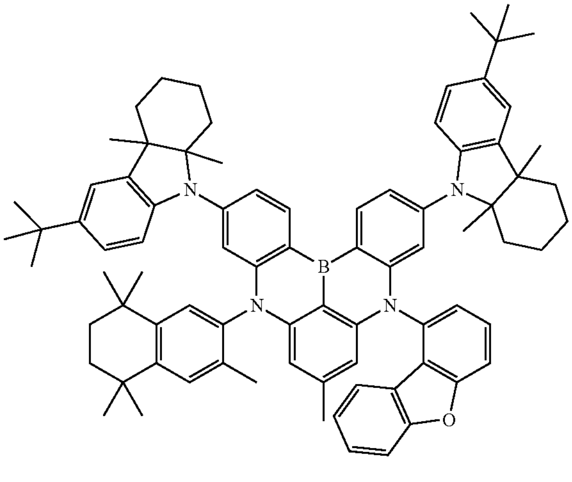

-continued
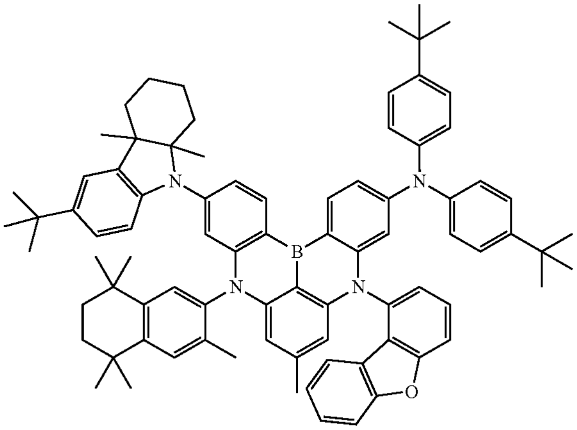
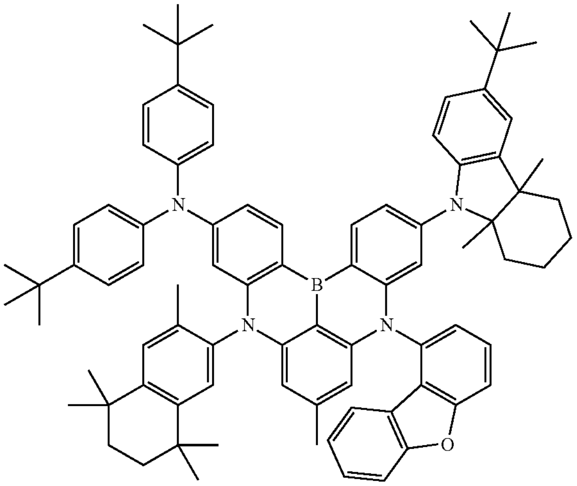
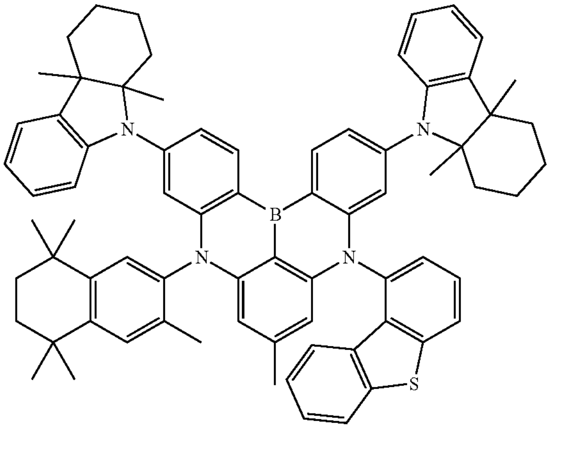
-continued
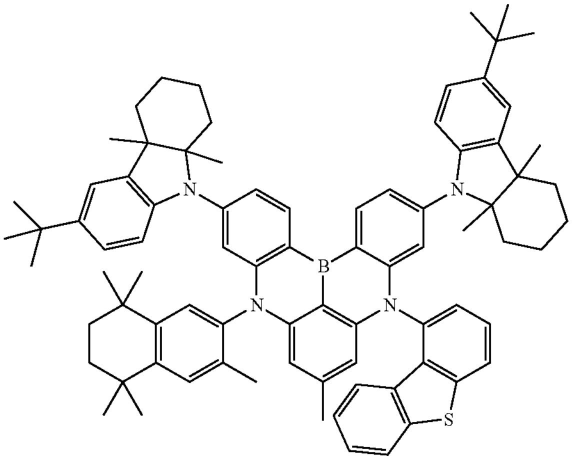
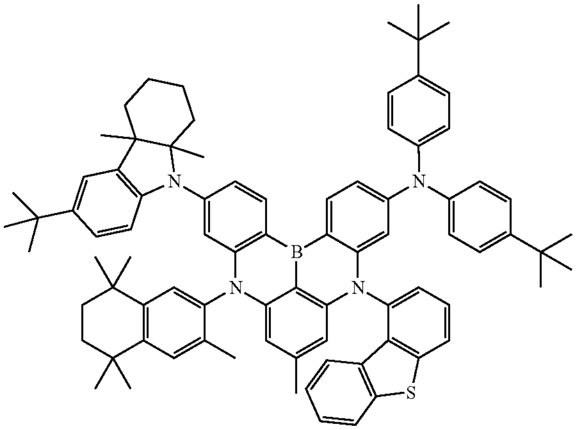
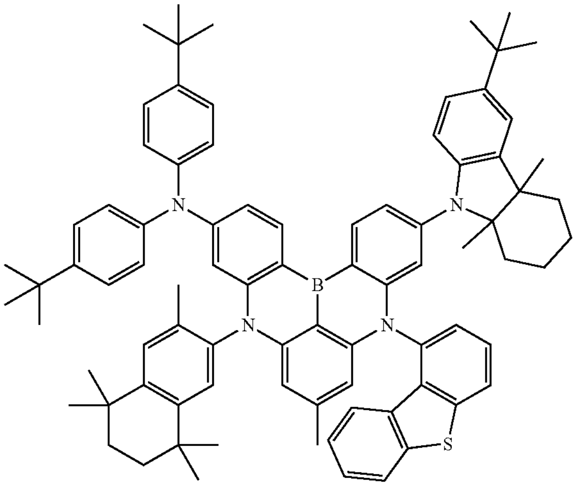

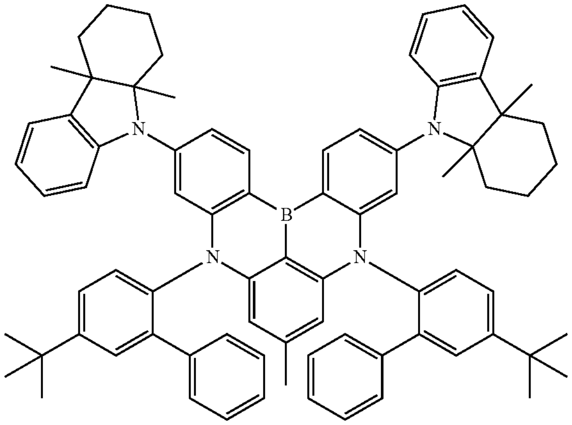
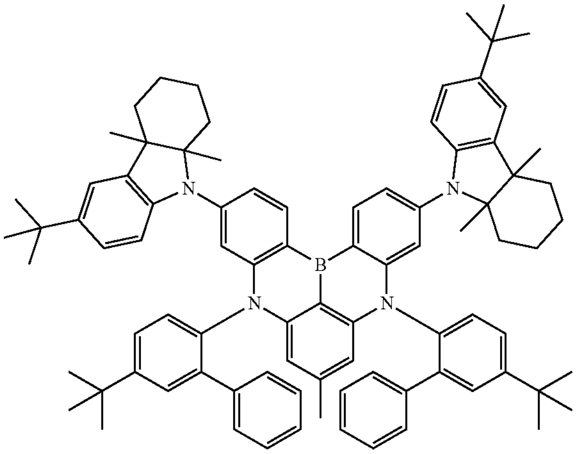
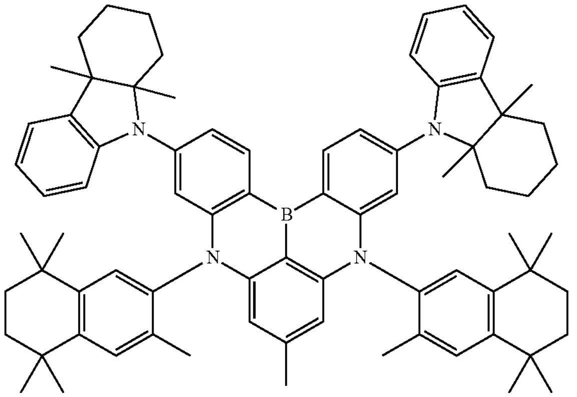
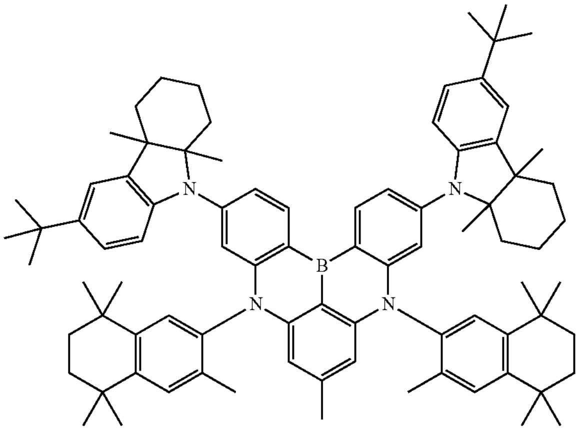
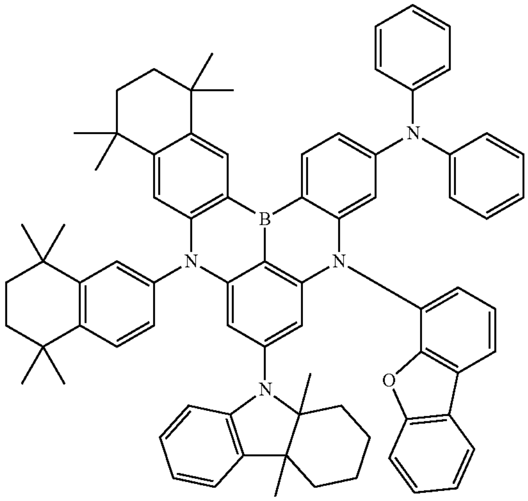
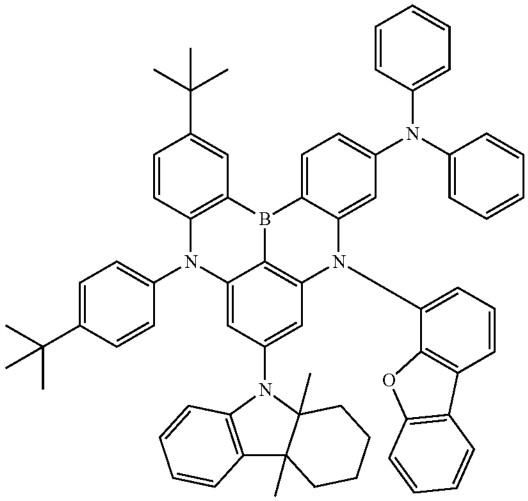
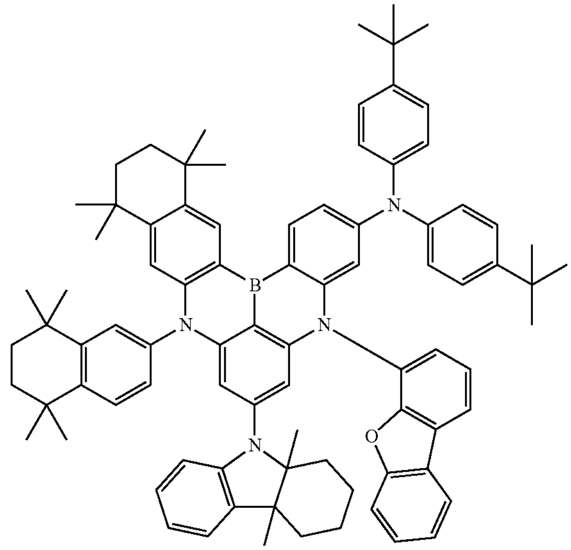

-continued
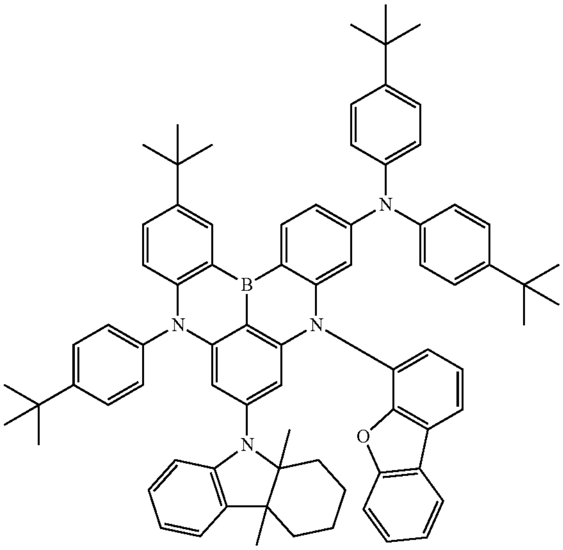
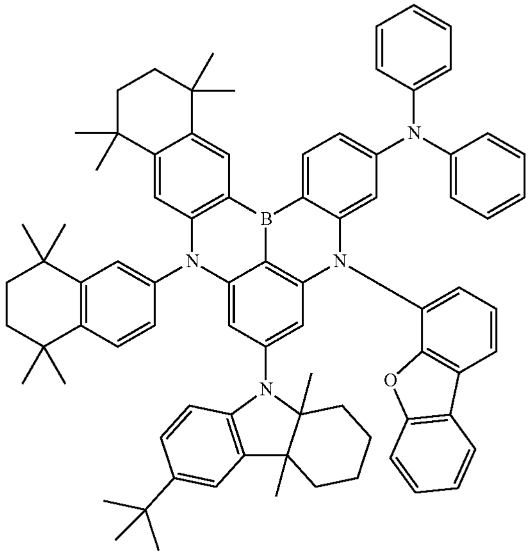
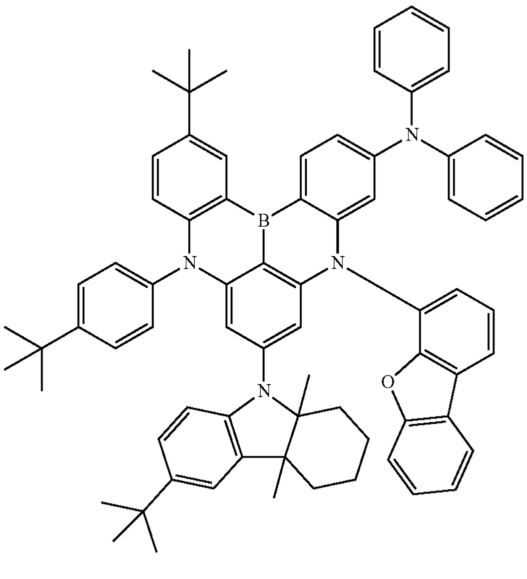
-continued
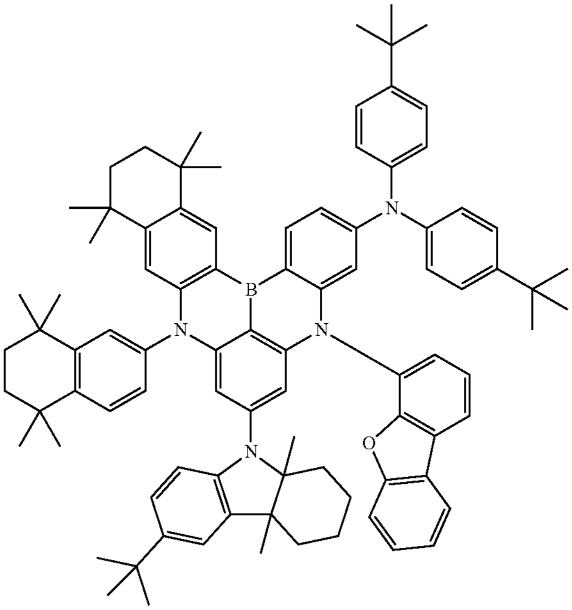
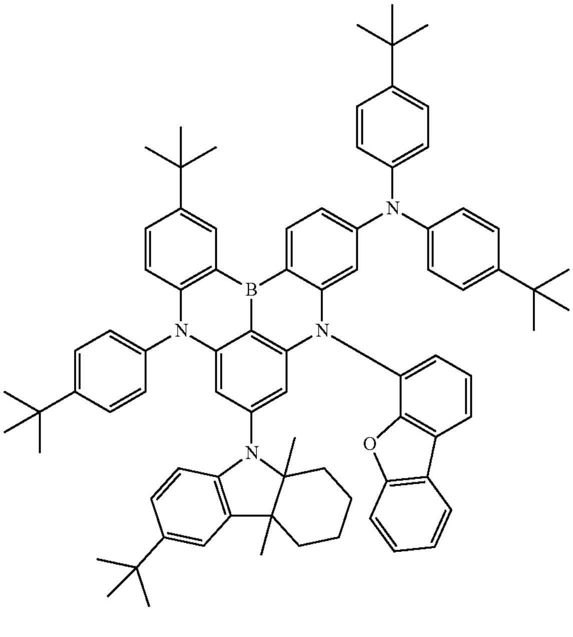

-continued
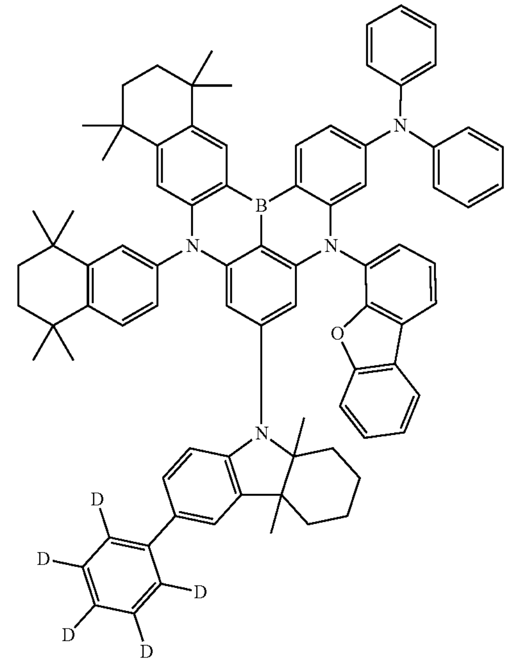
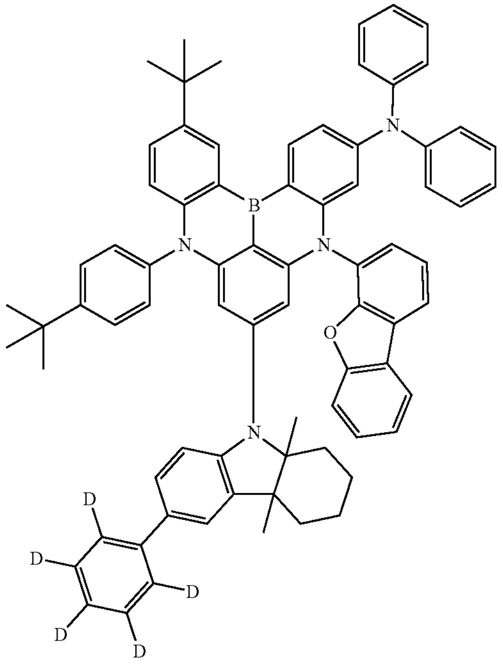
-continued
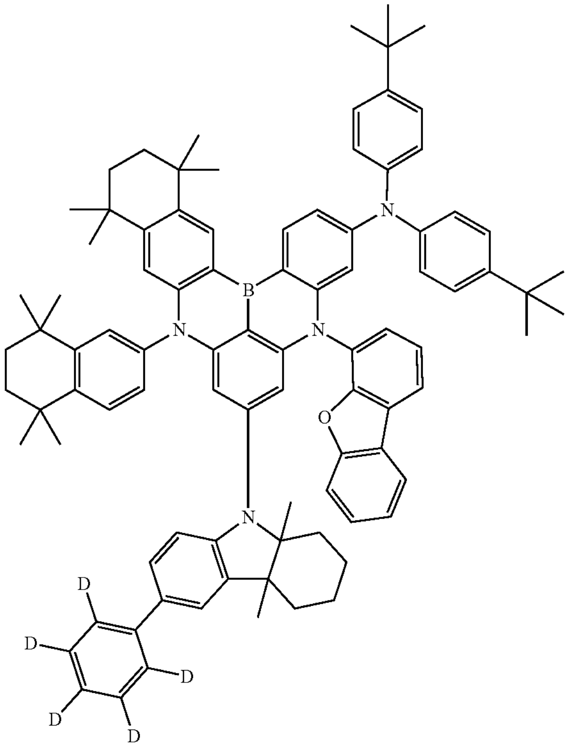
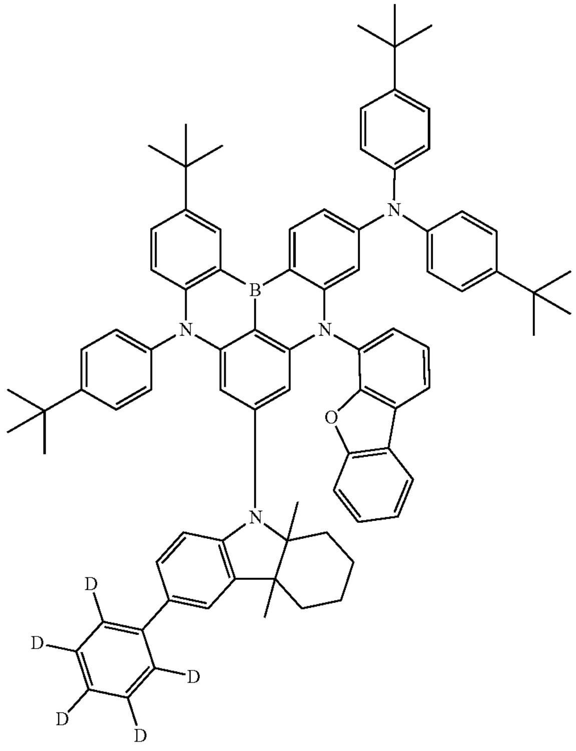

-continued
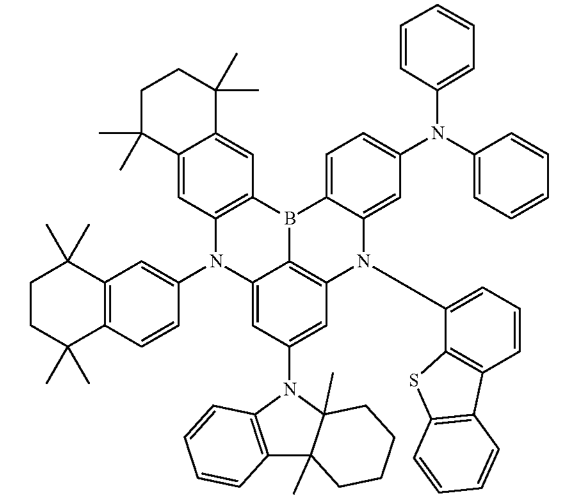
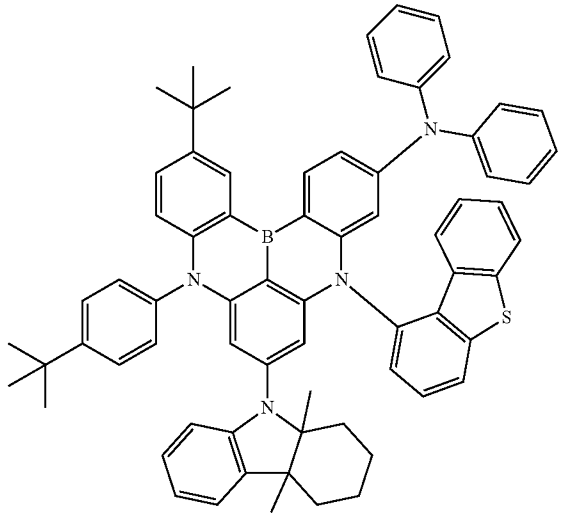
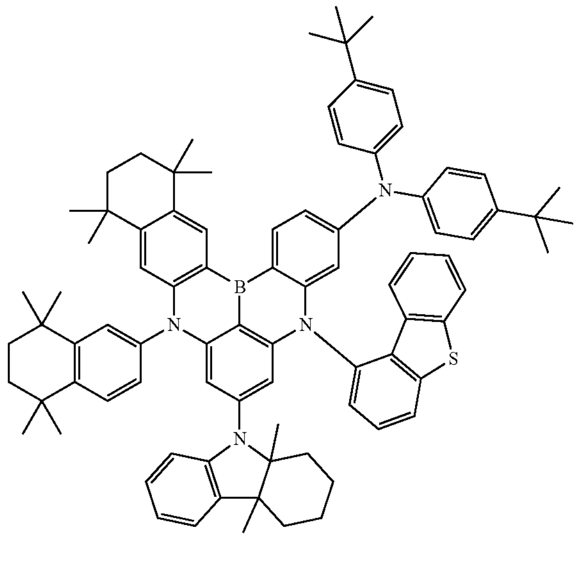
-continued
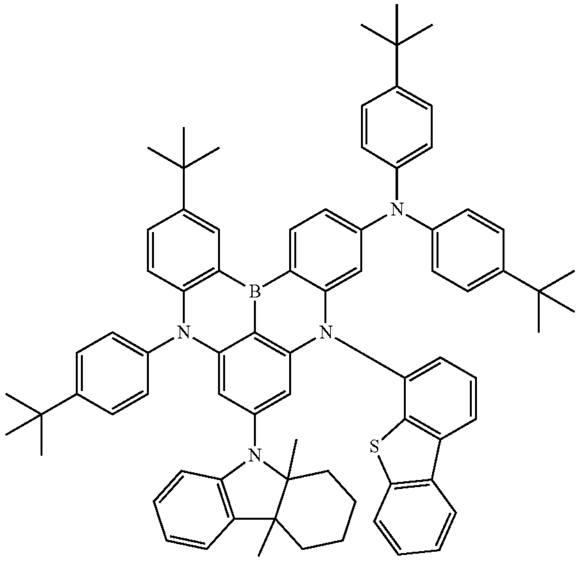
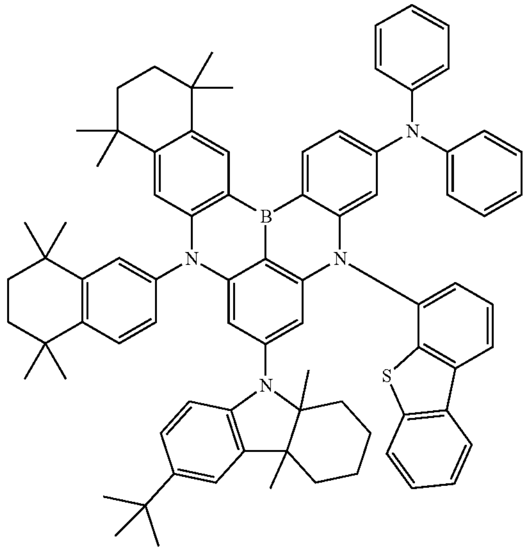
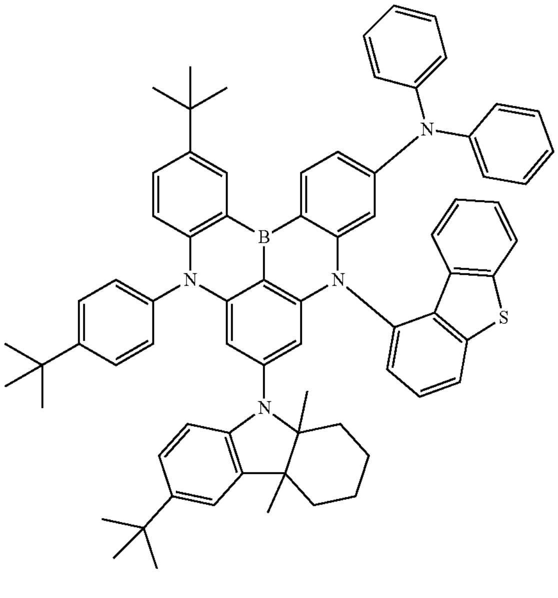

-continued
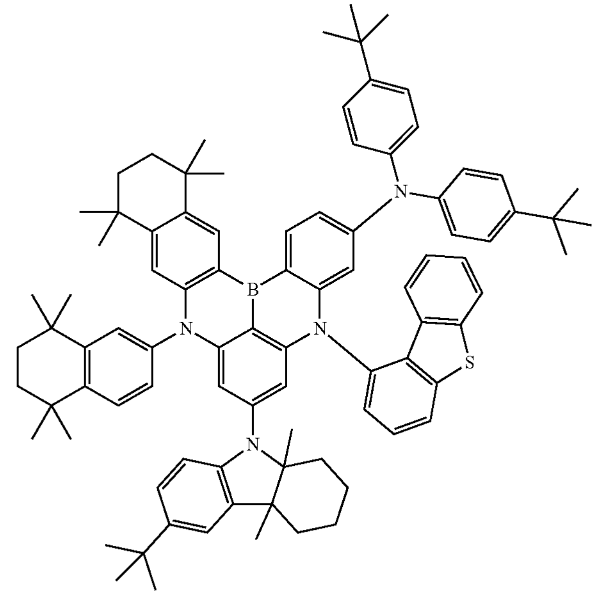
-continued
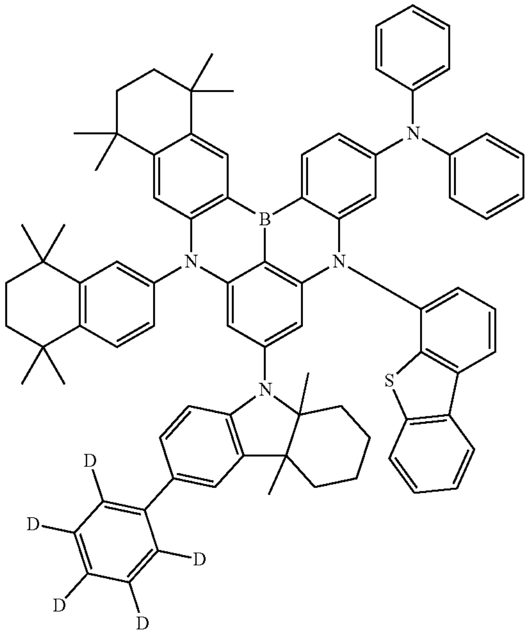
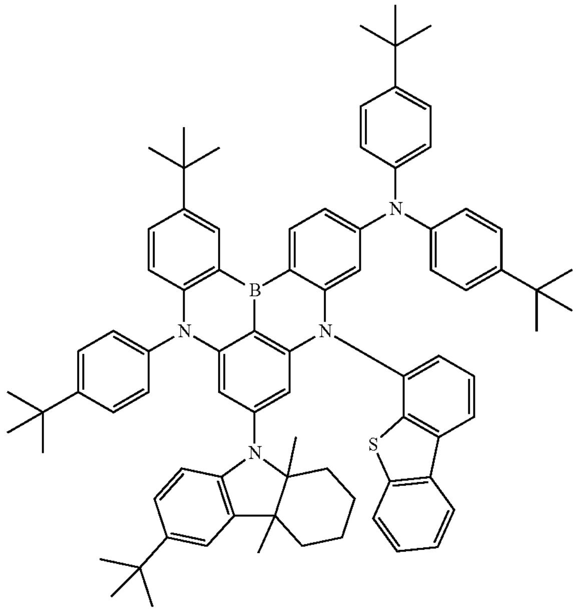
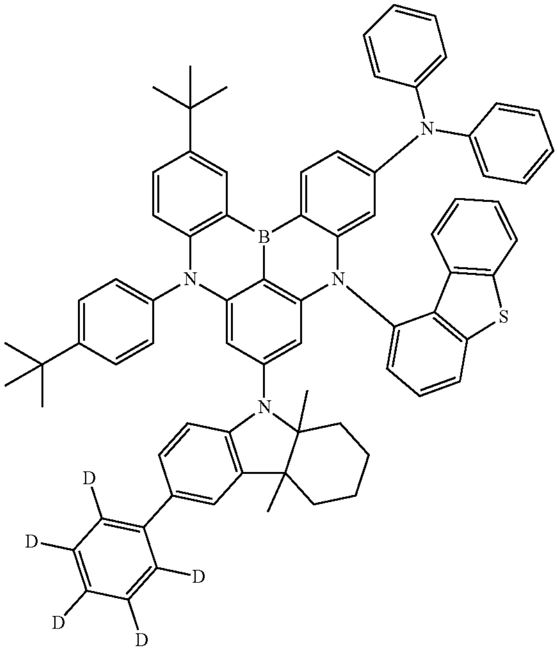

-continued
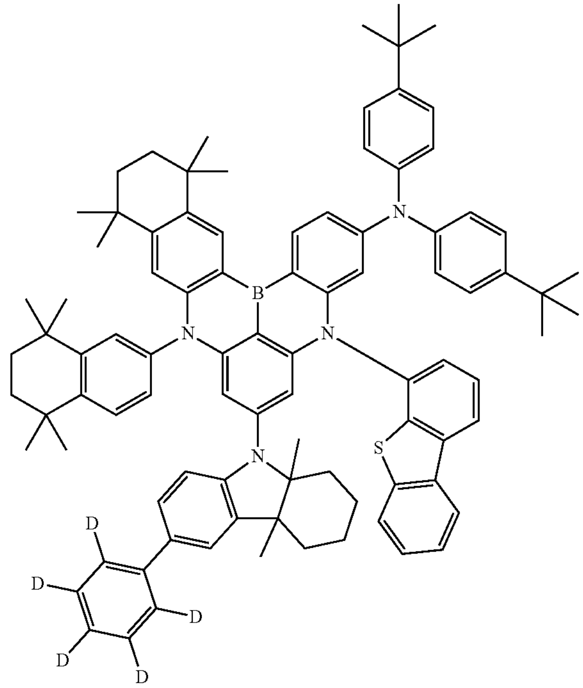
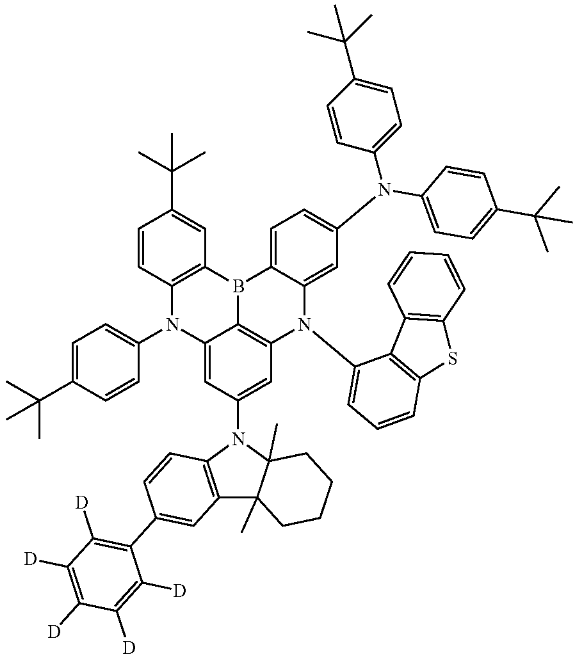
-continued
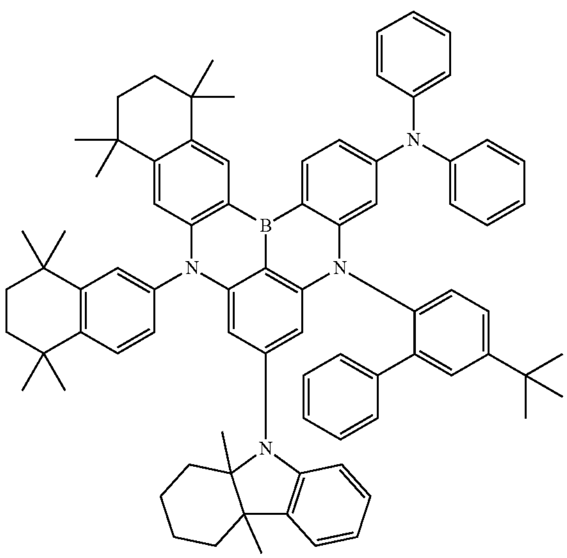
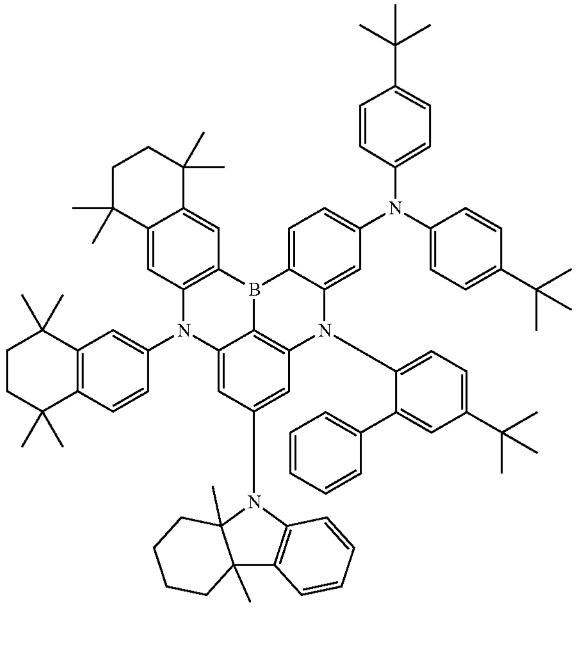

-continued
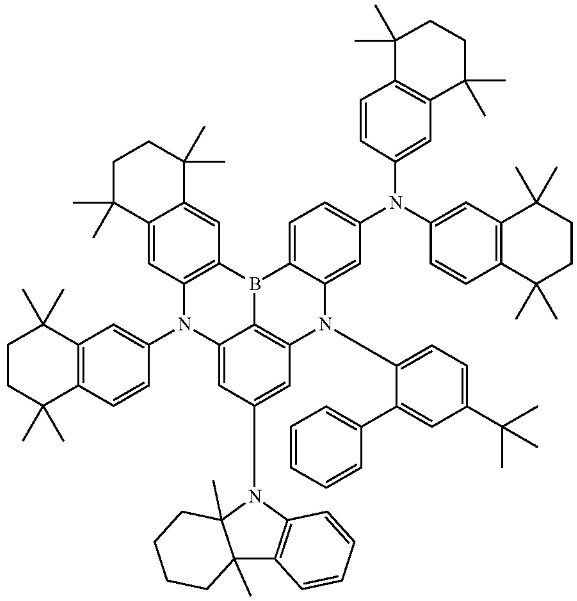
-continued
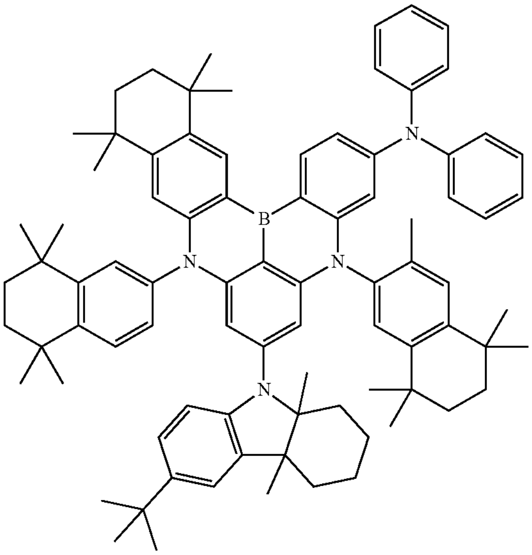
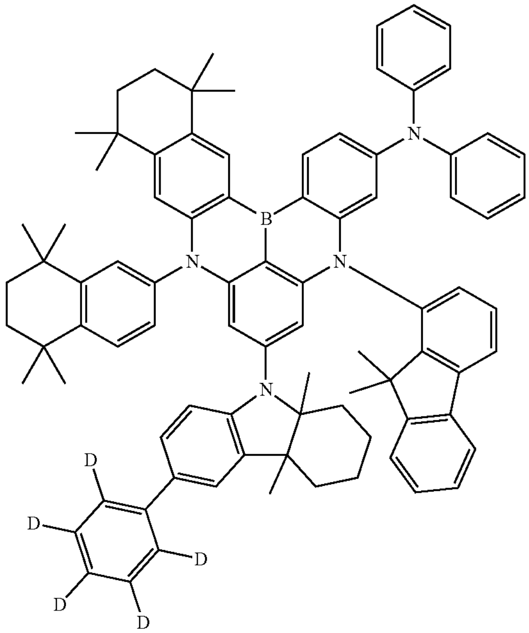
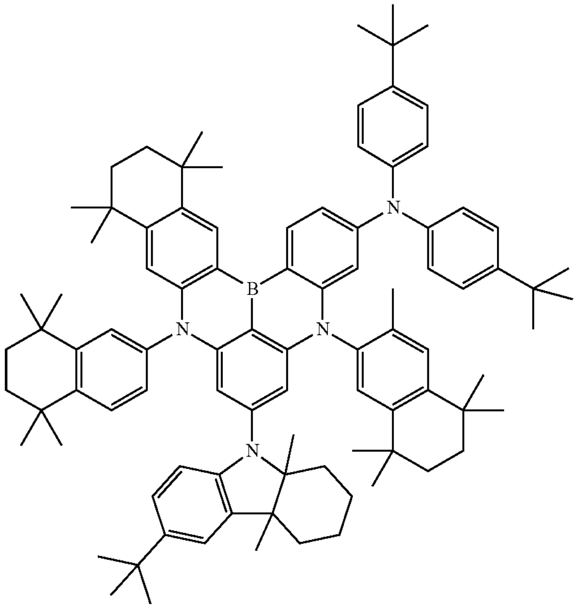

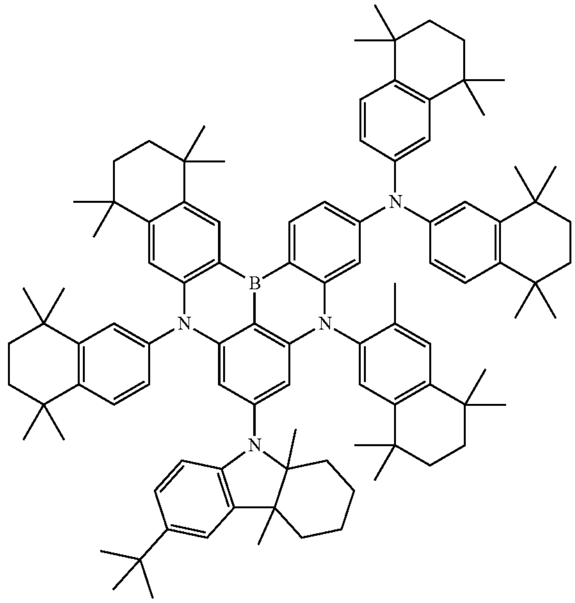
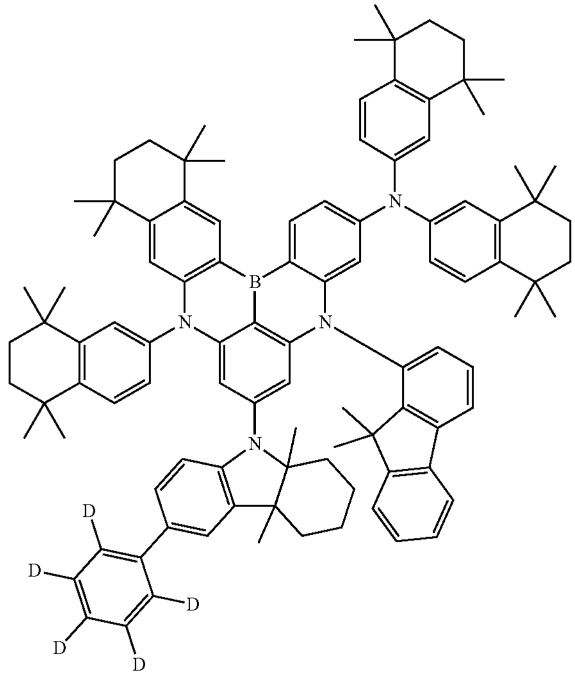
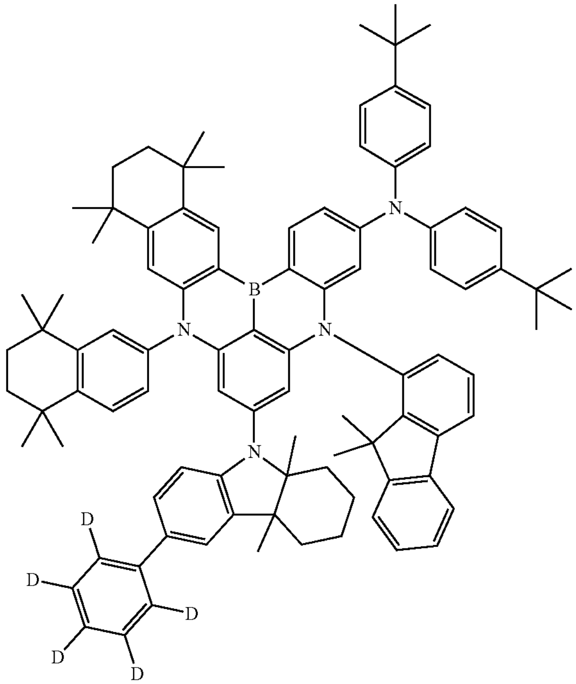
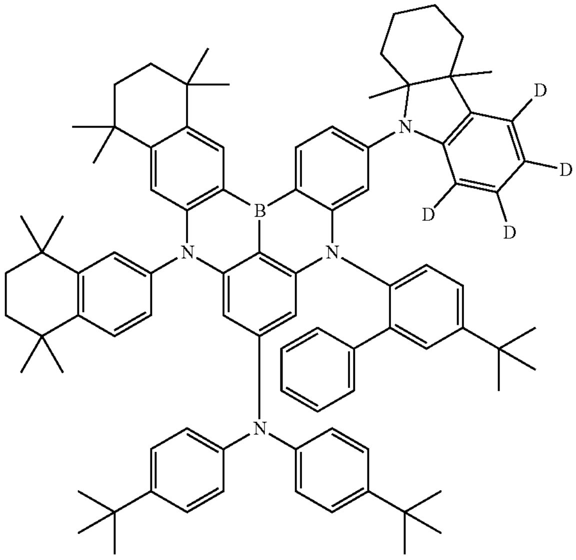

-continued
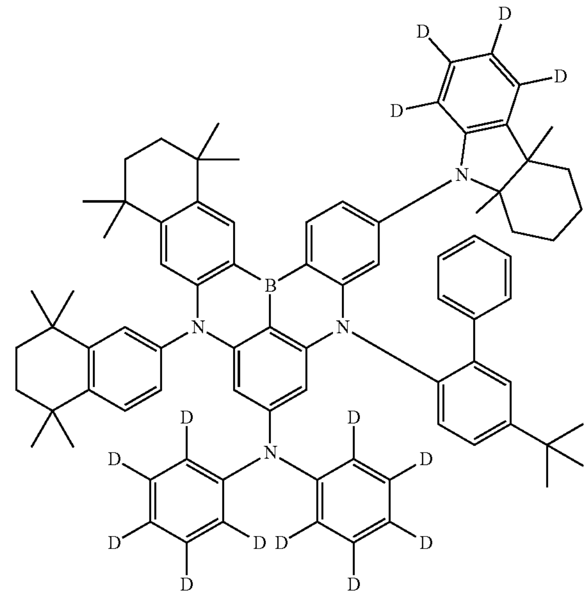
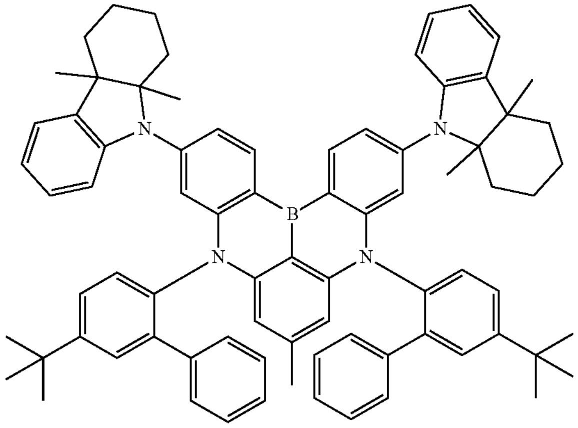
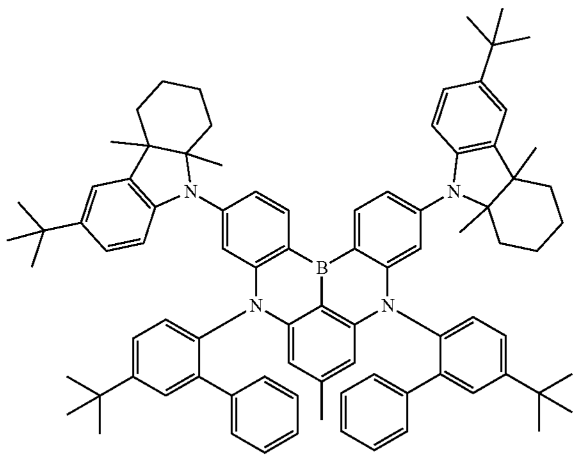
-continued
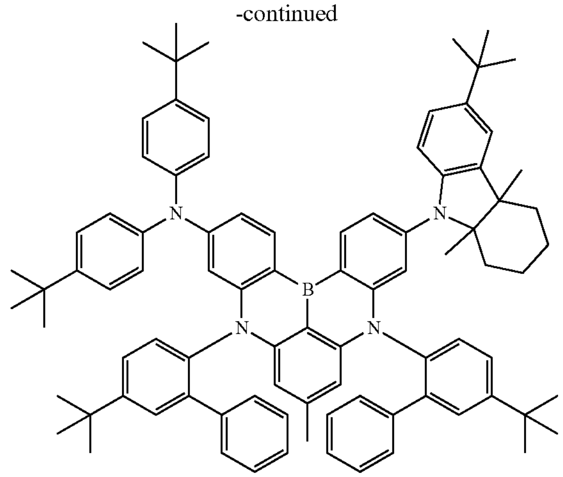
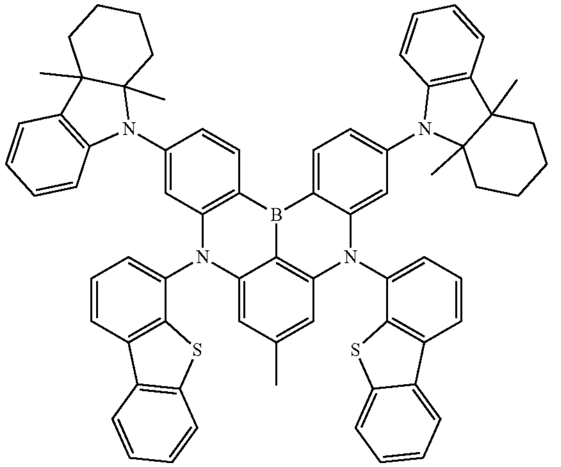
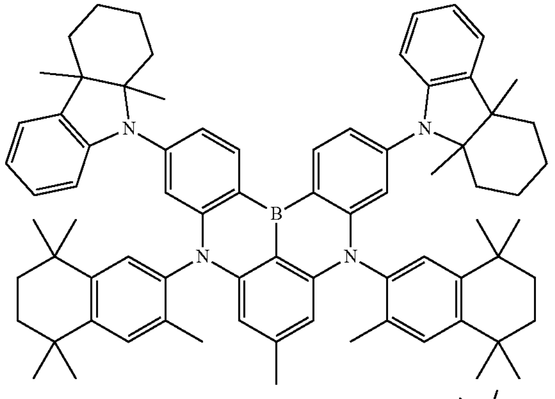
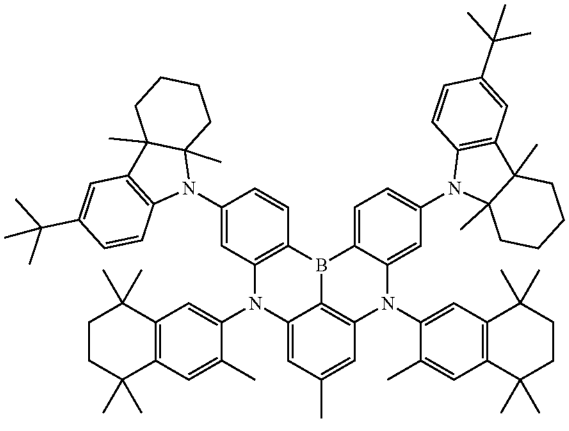

-continued
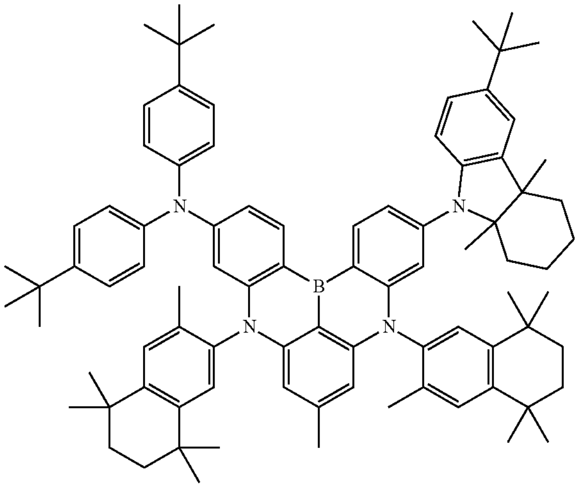
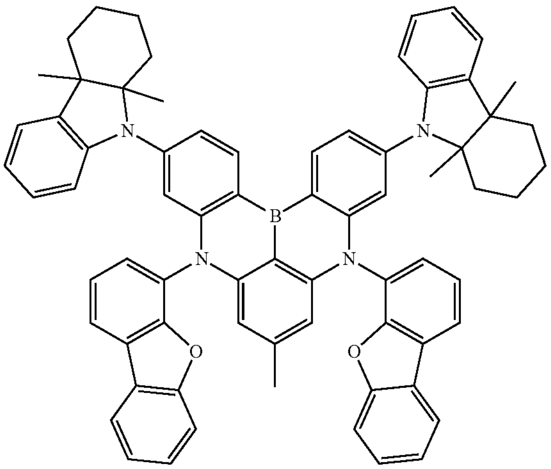
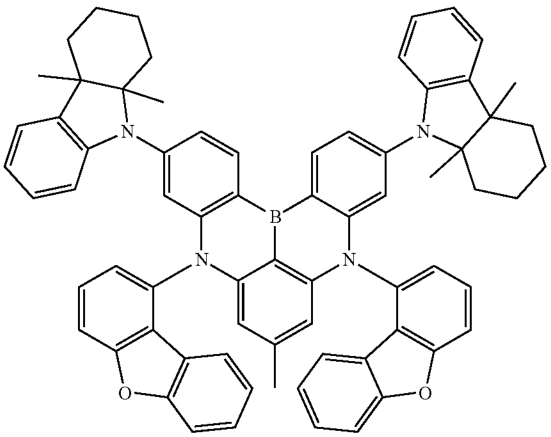
-continued
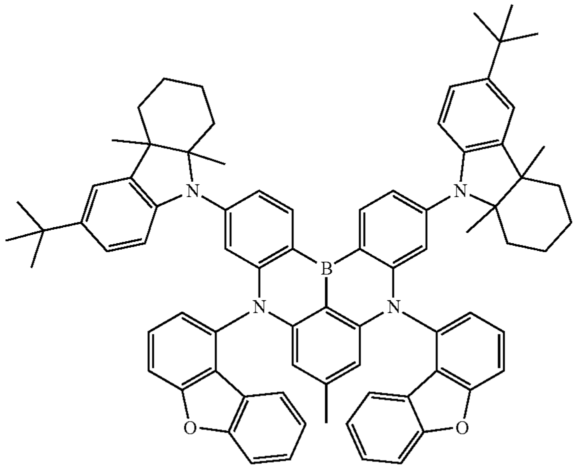
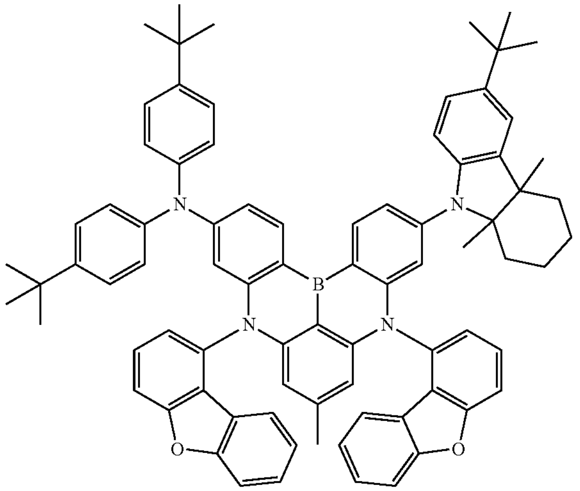
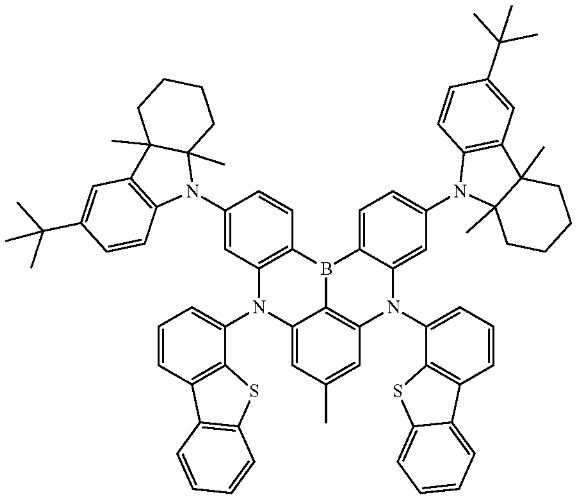

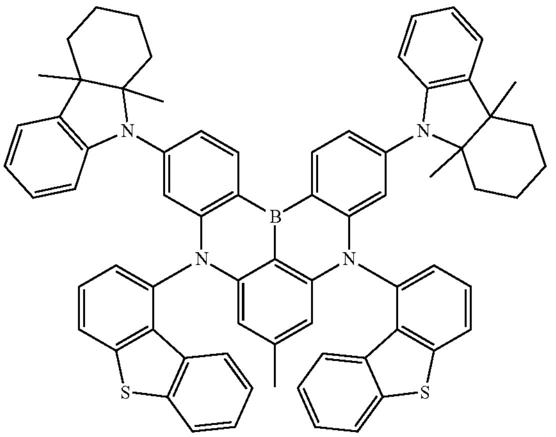
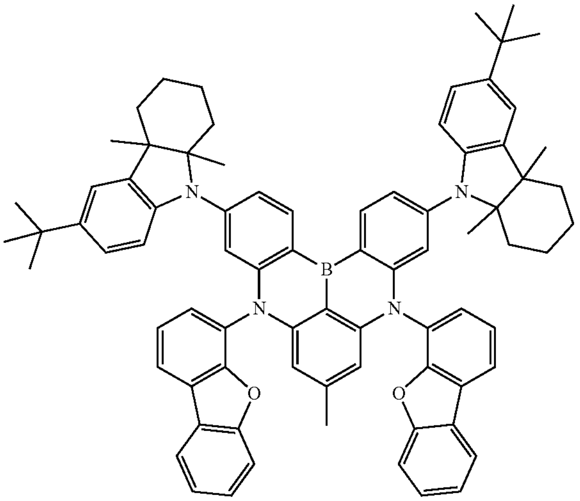
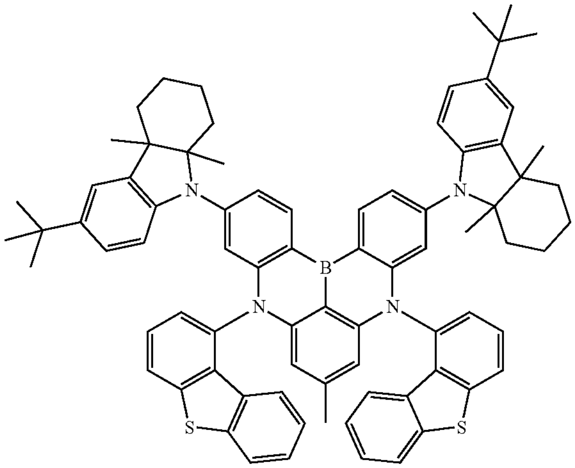
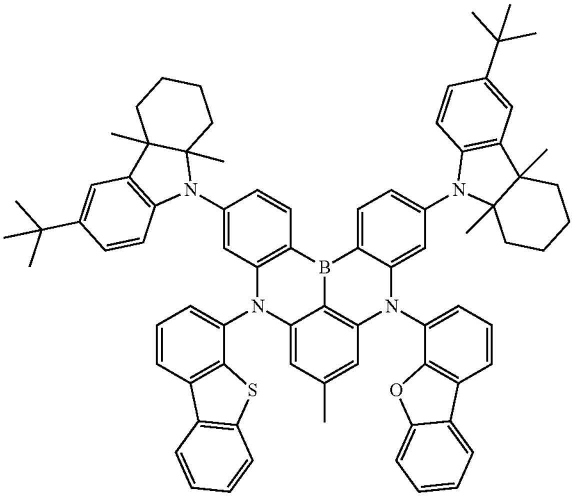
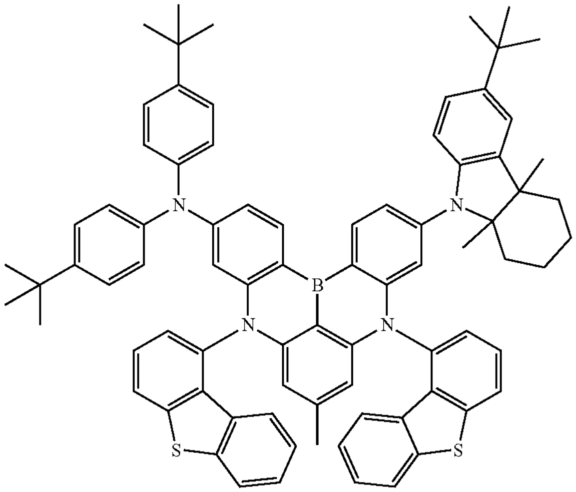
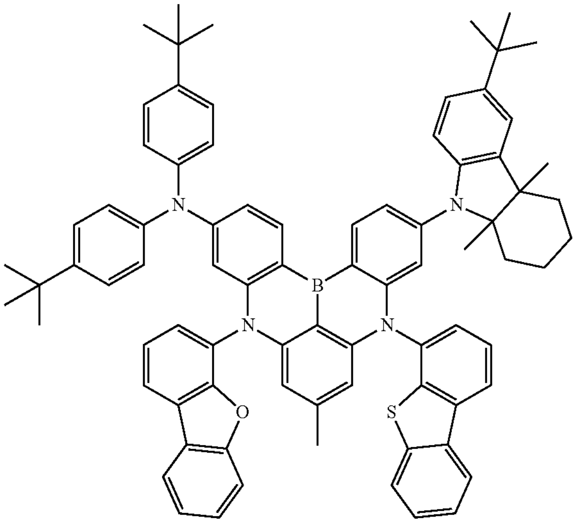

-continued
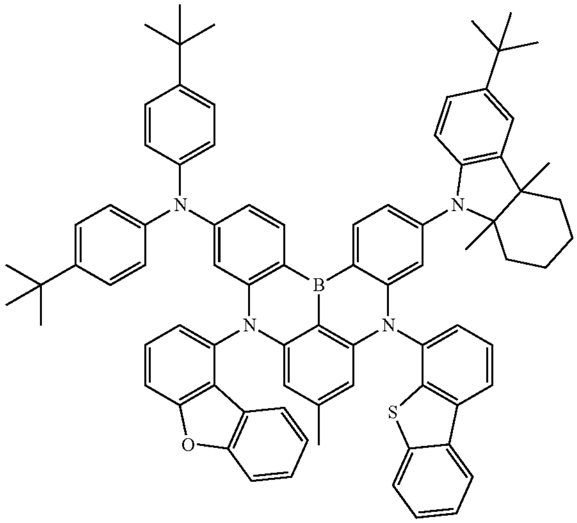
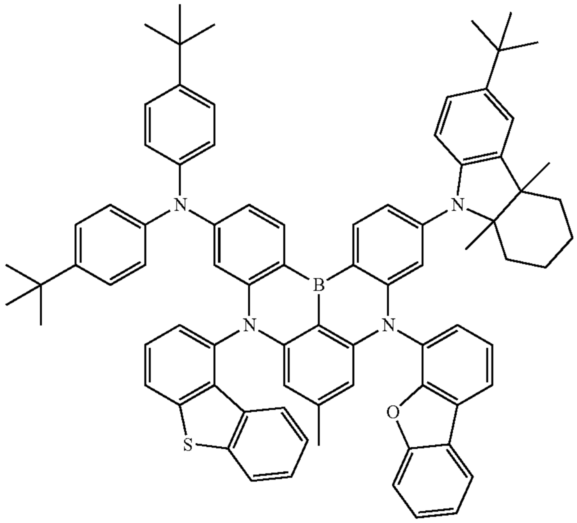
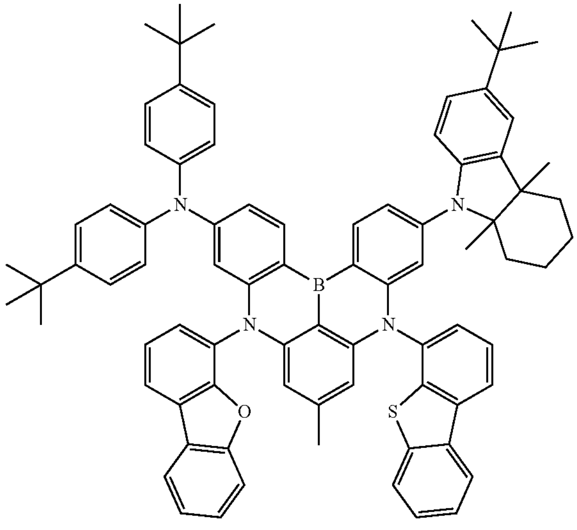
-continued
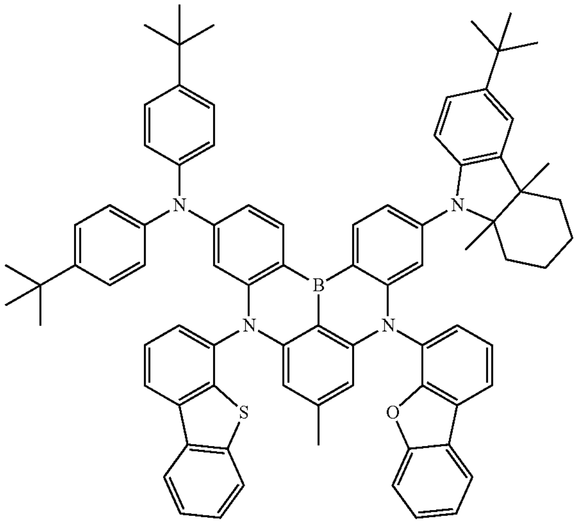
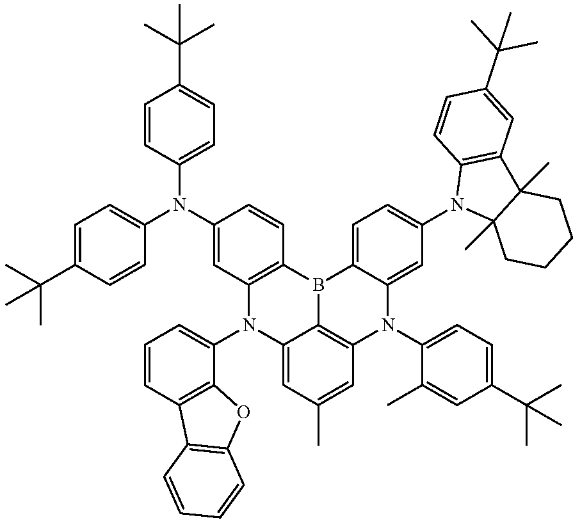
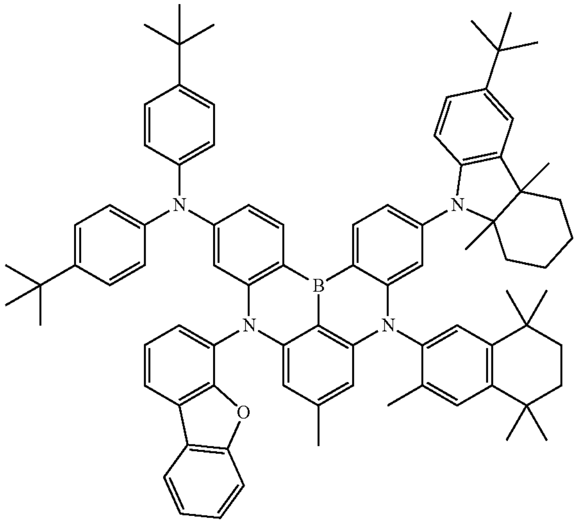

-continued
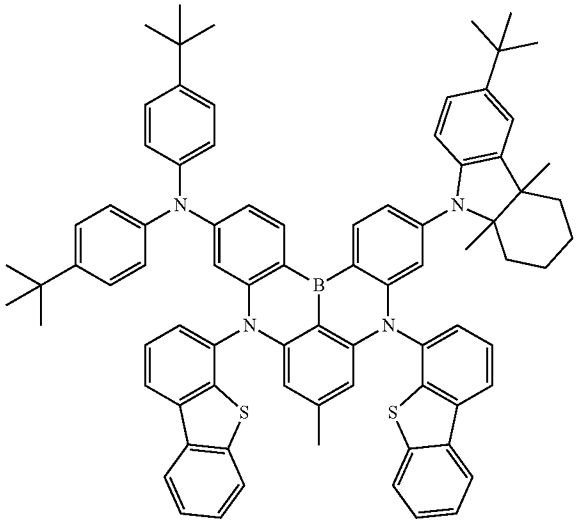
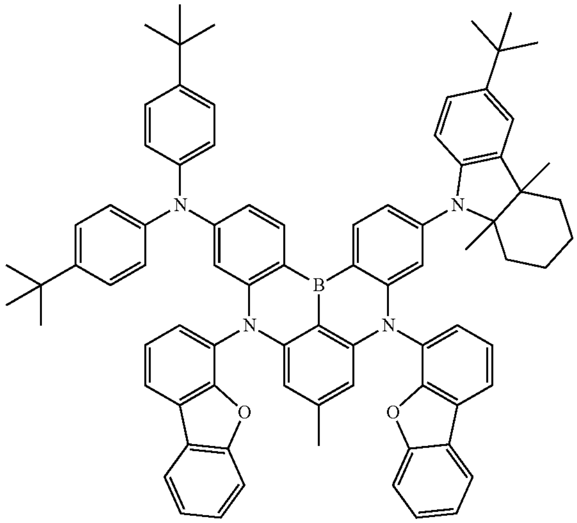
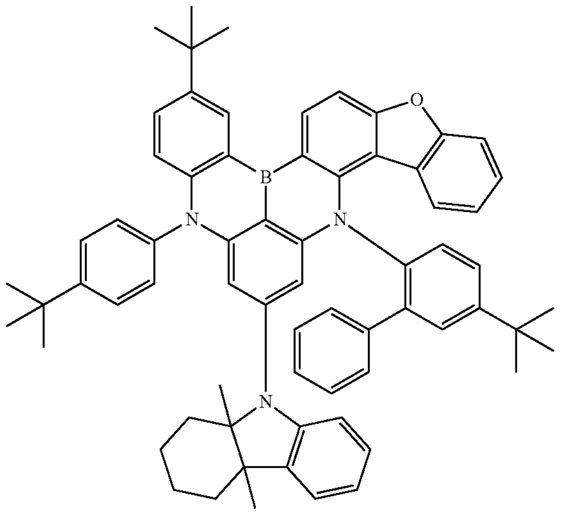
-continued
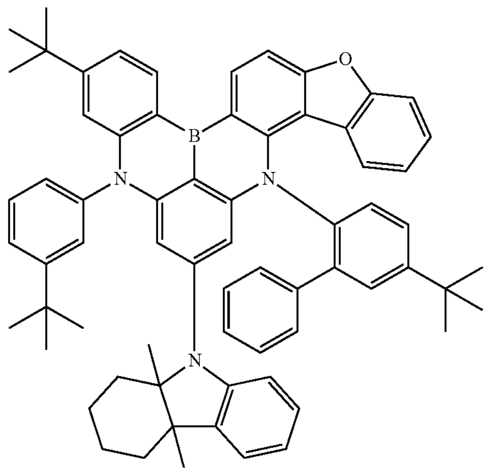
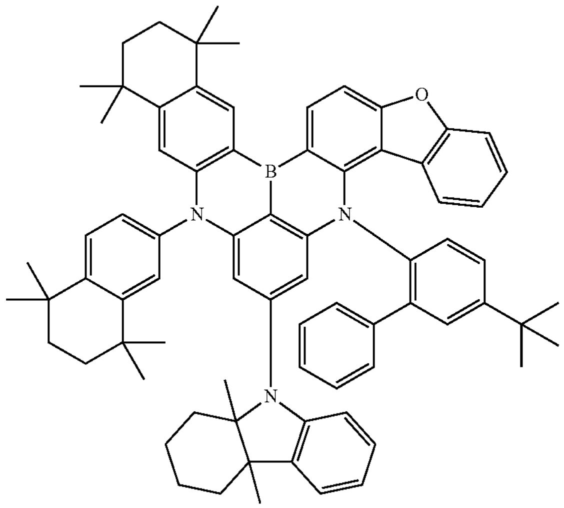
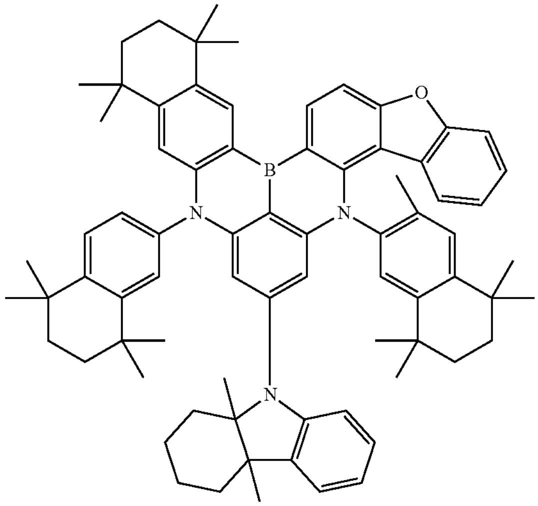

-continued
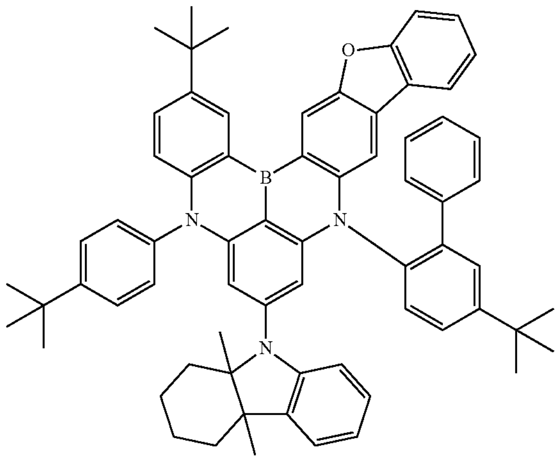
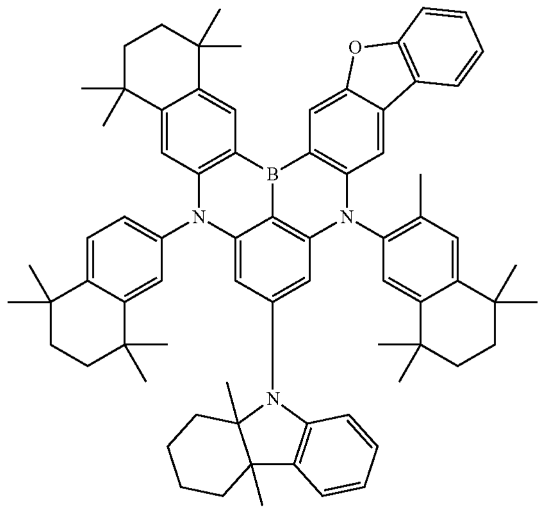
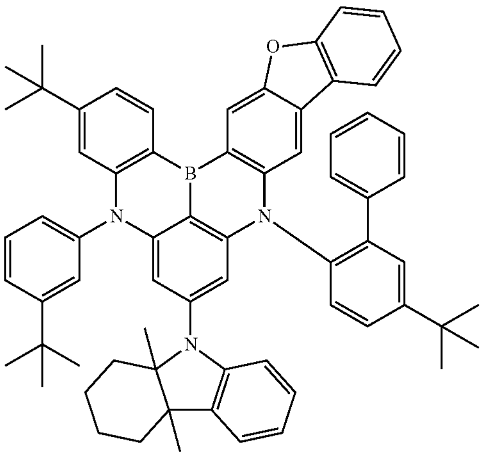
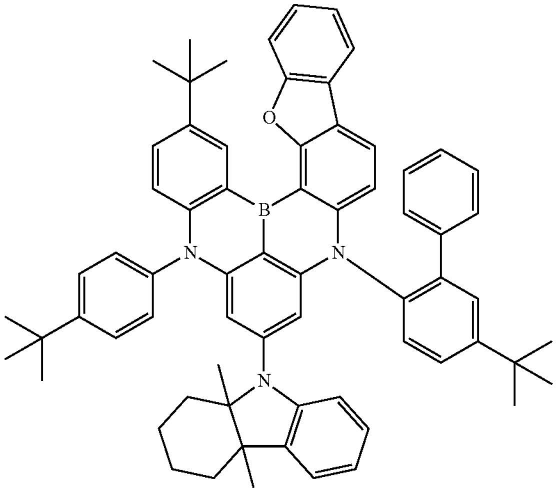
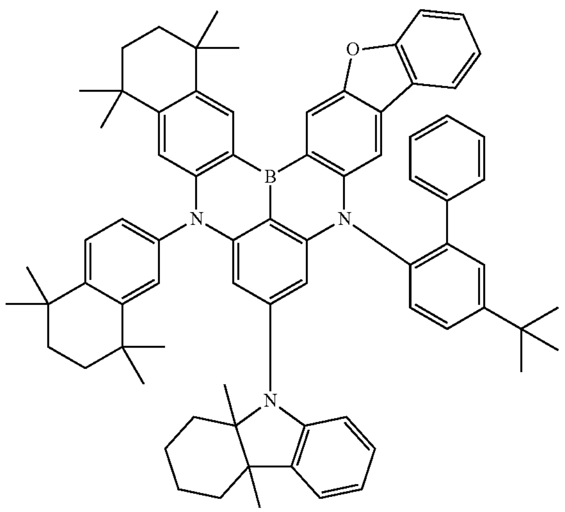
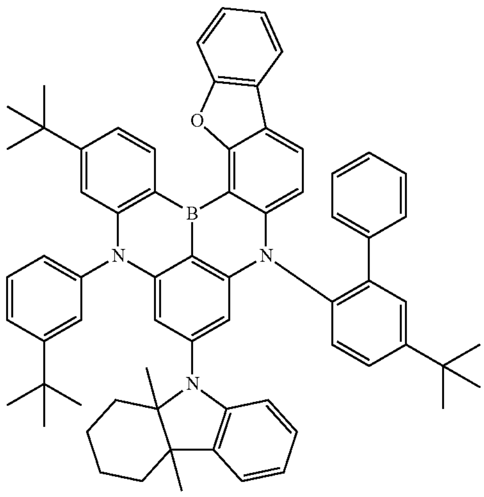
-continued -continued
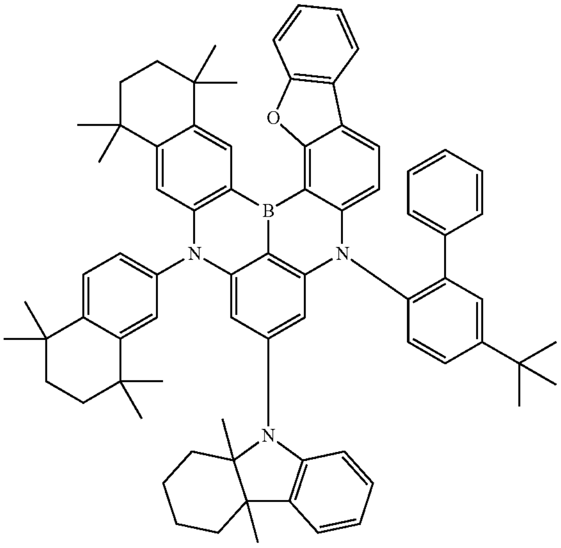
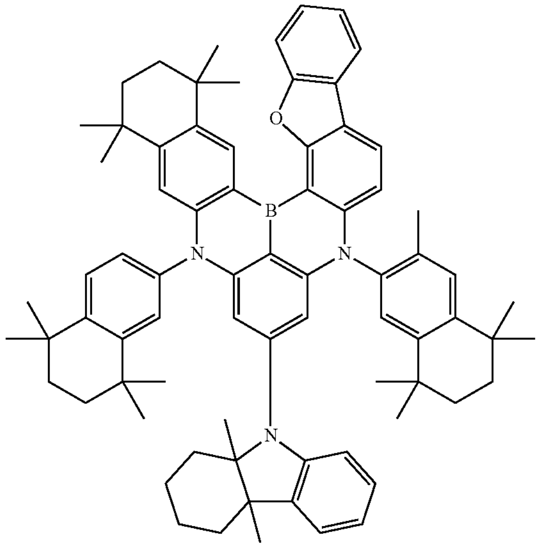
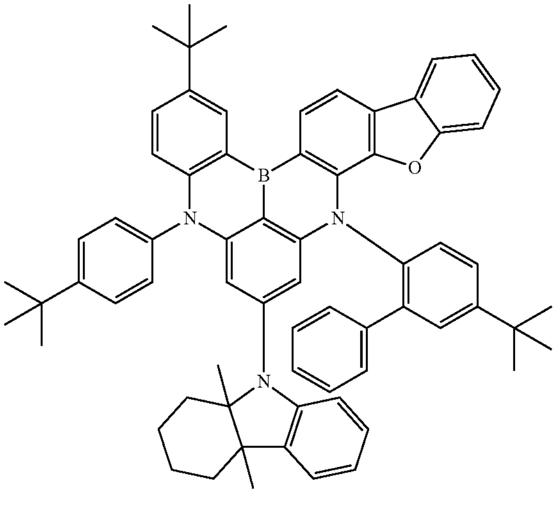
-continued
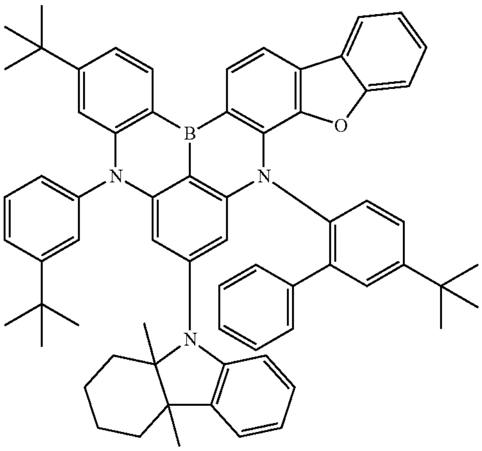
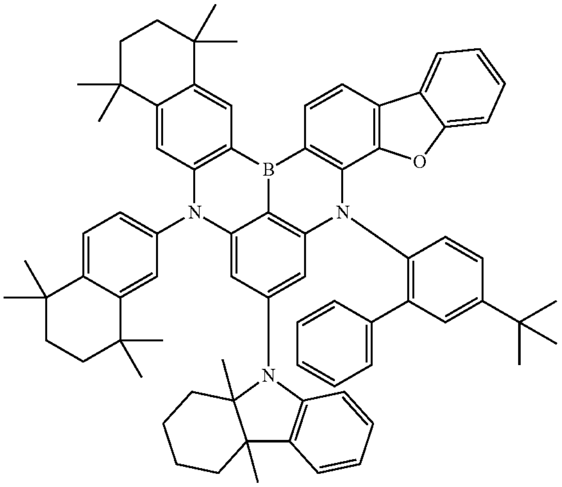
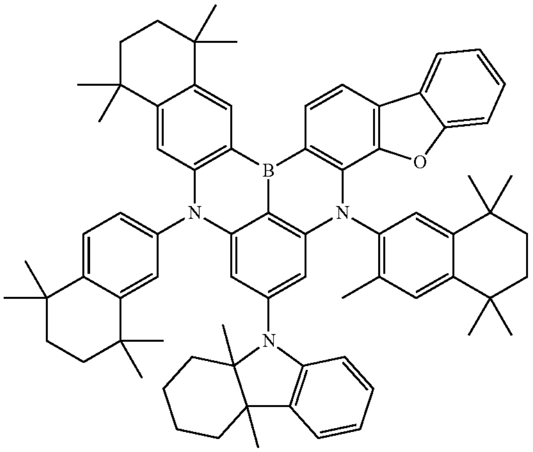

-continued
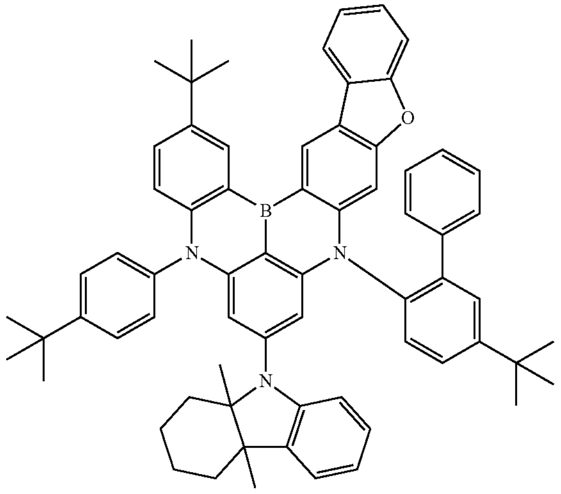
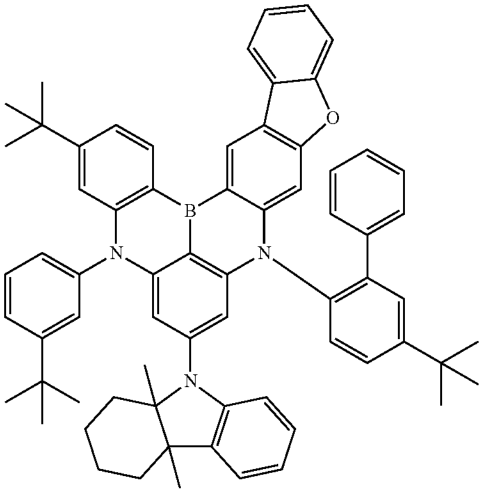
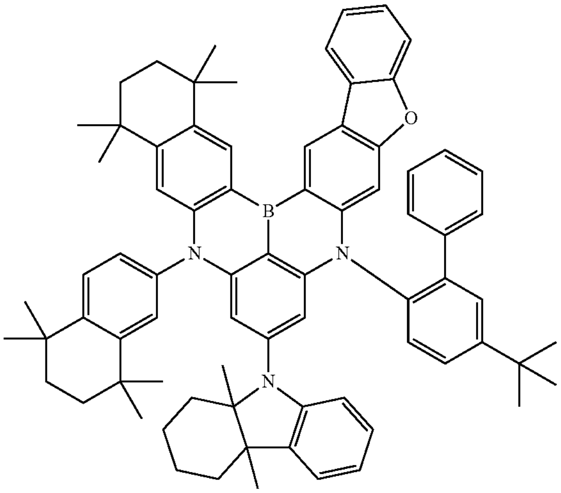
-continued
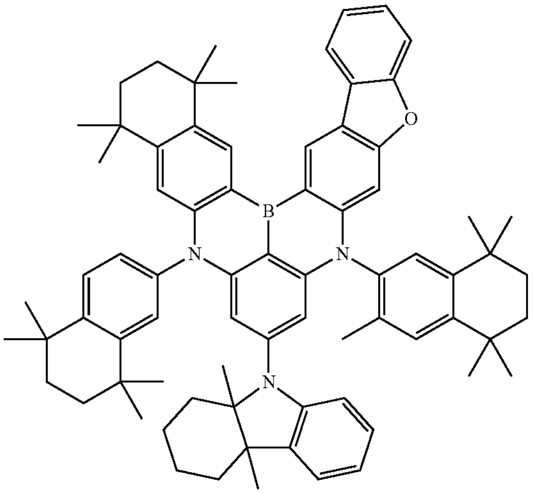
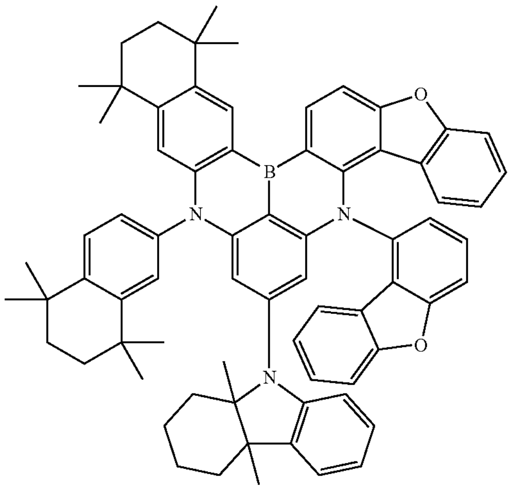
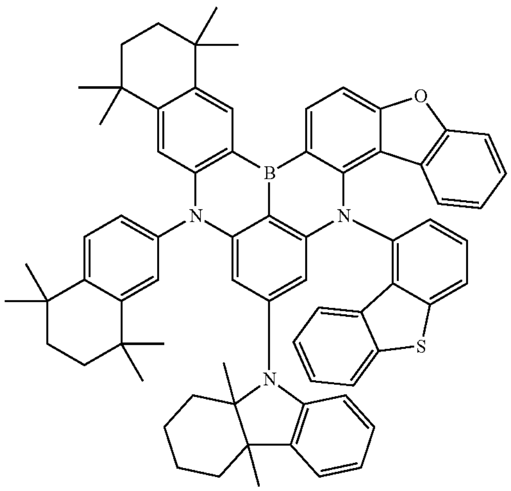

-continued
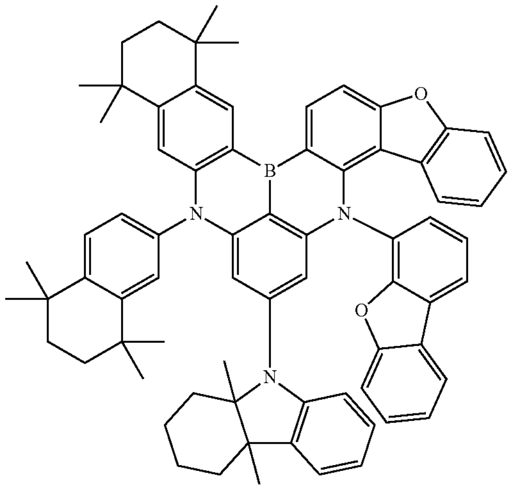
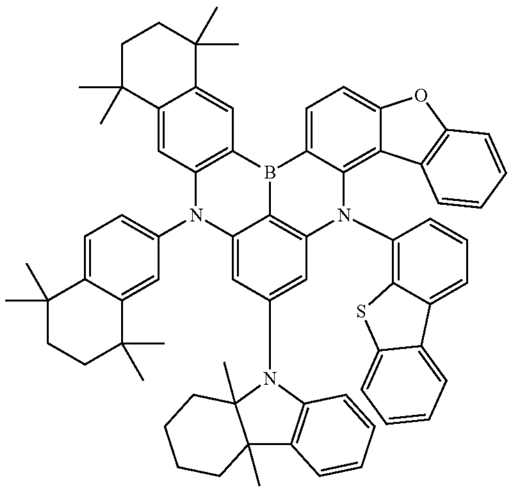
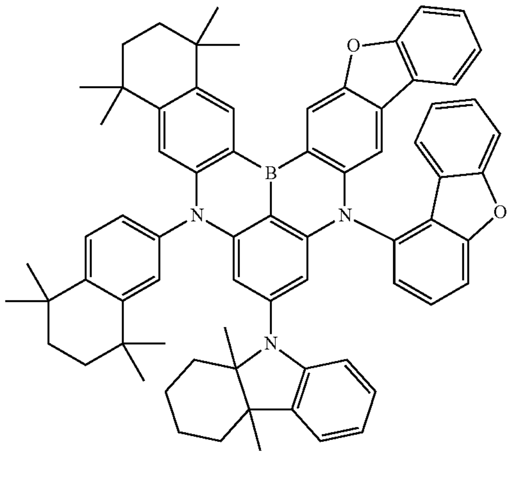
-continued
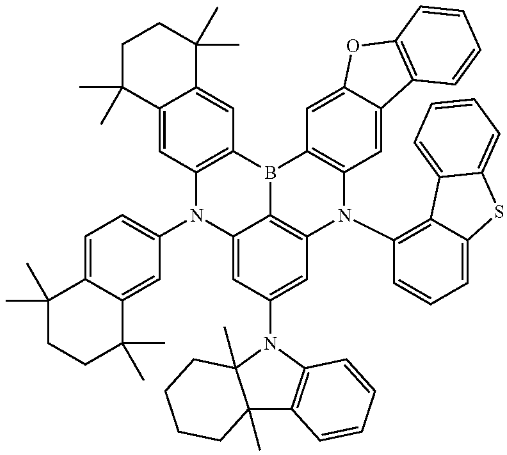
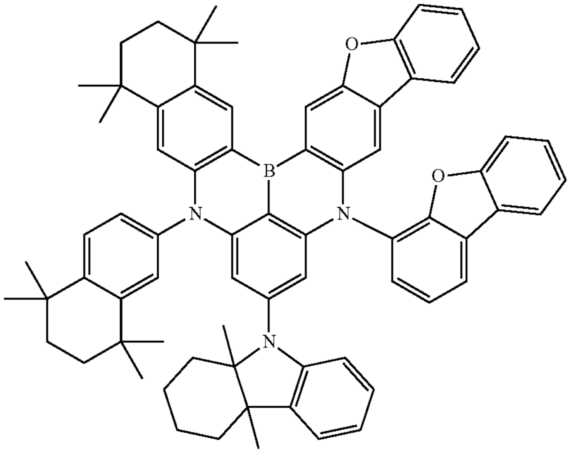
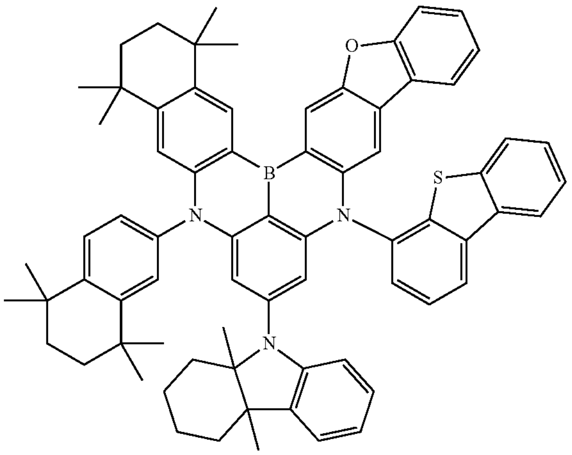

-continued
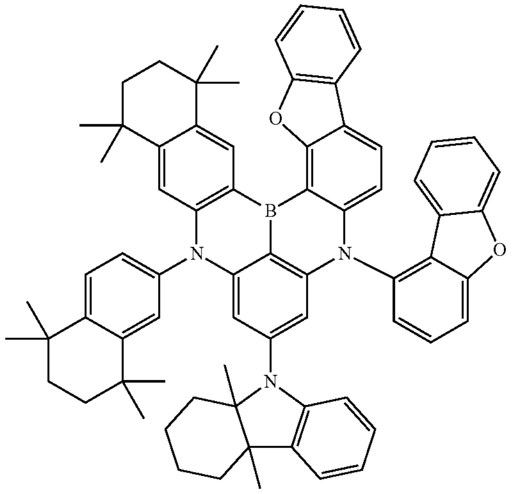
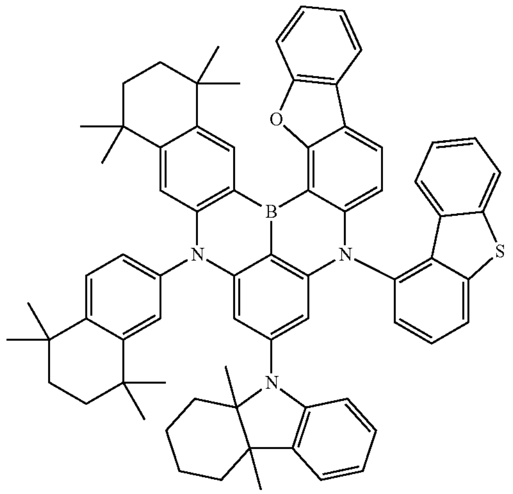
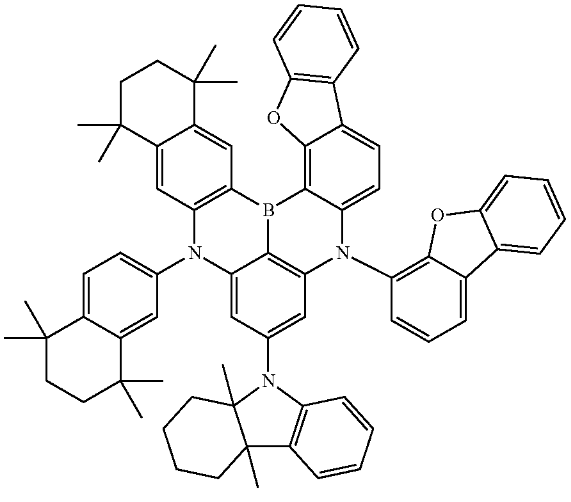
-continued
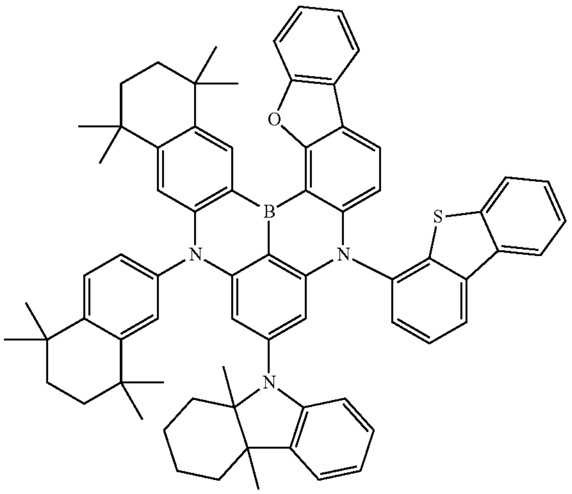
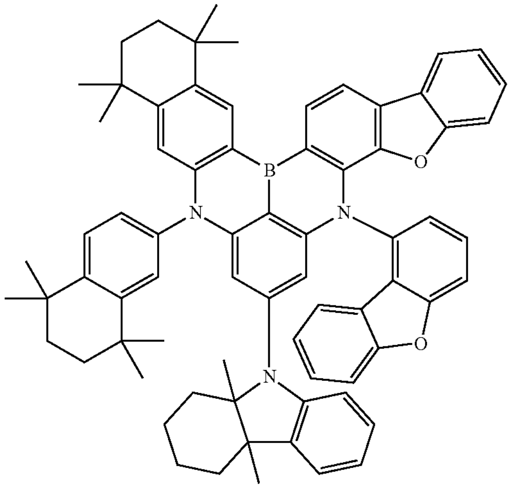
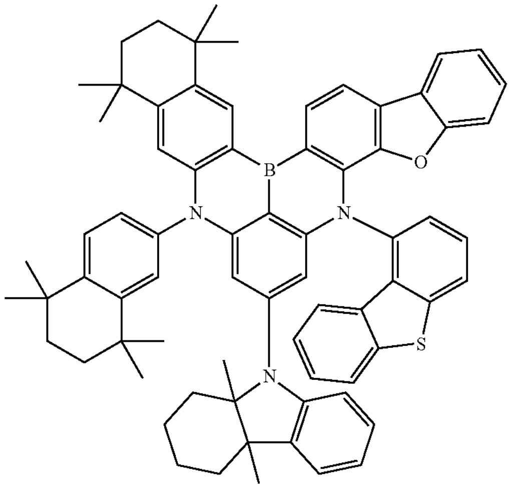

-continued
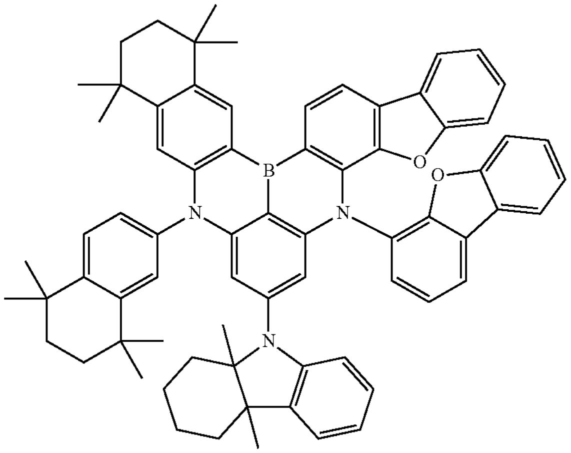
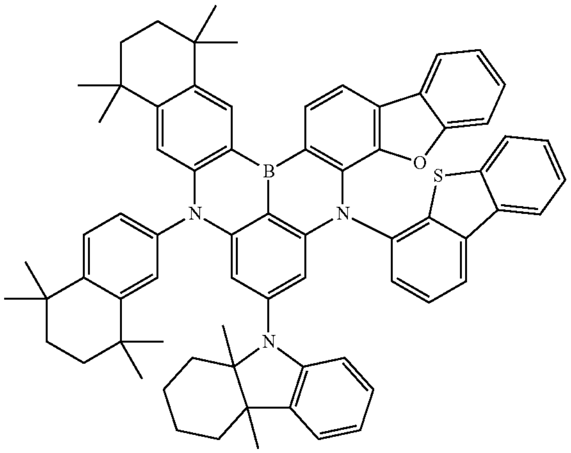
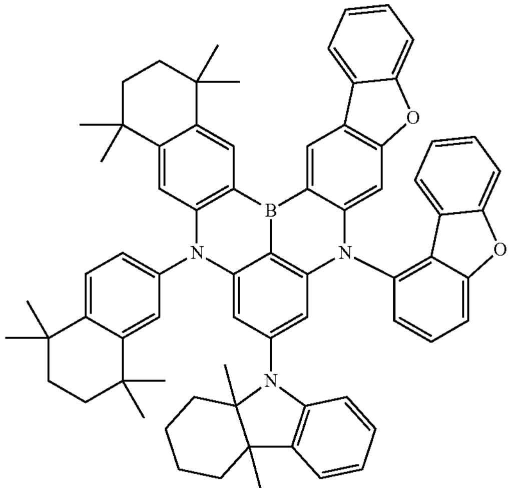
-continued
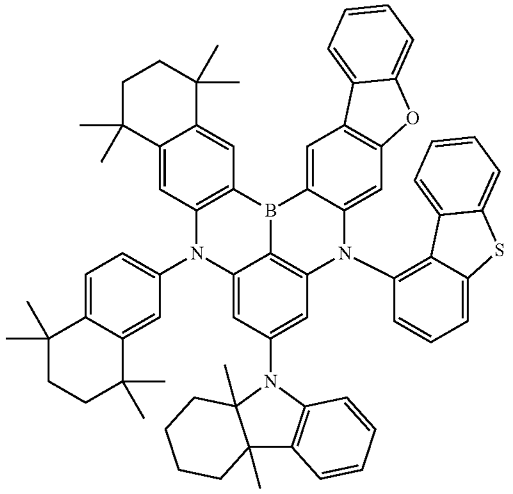
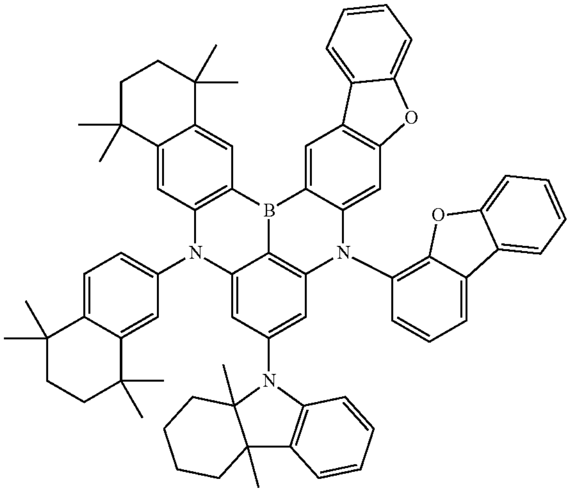
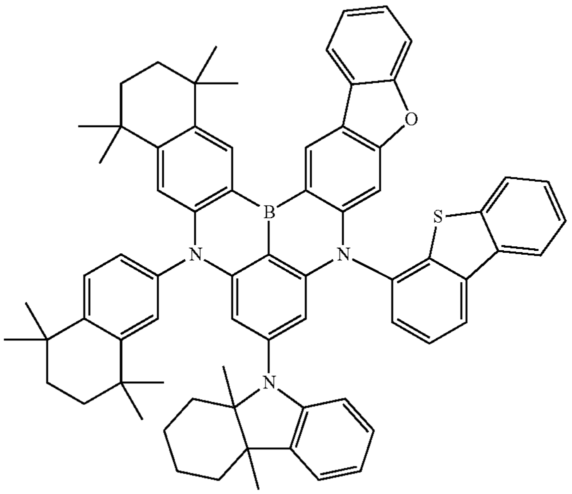

-continued
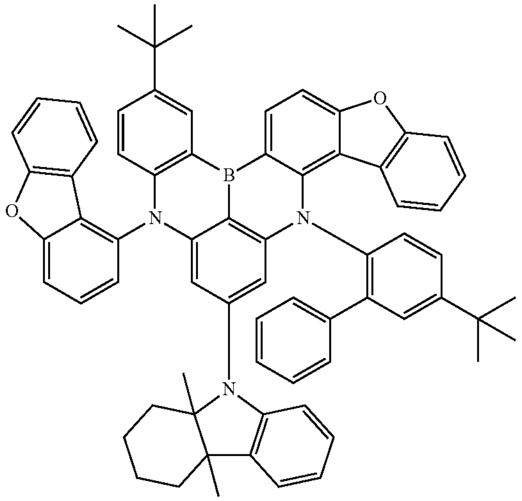
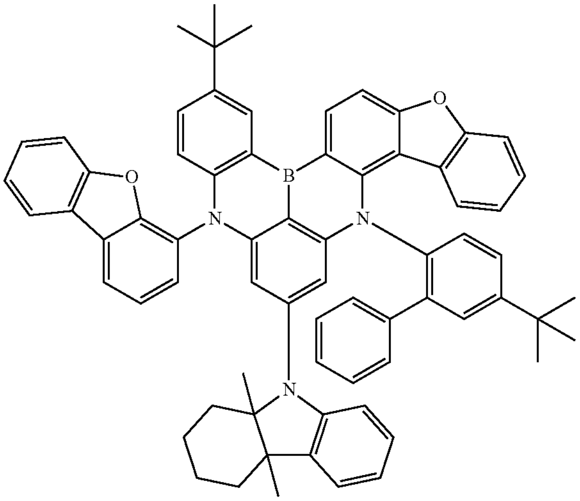
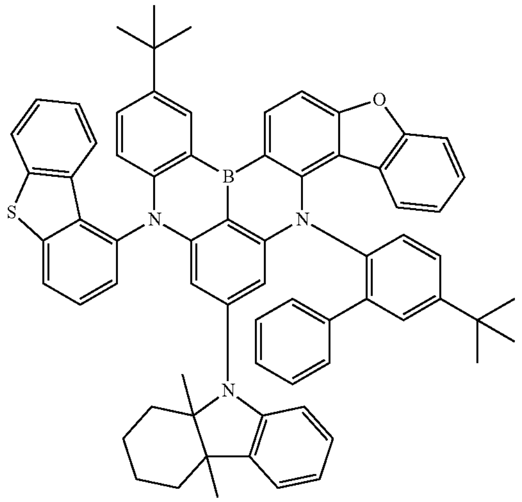
-continued
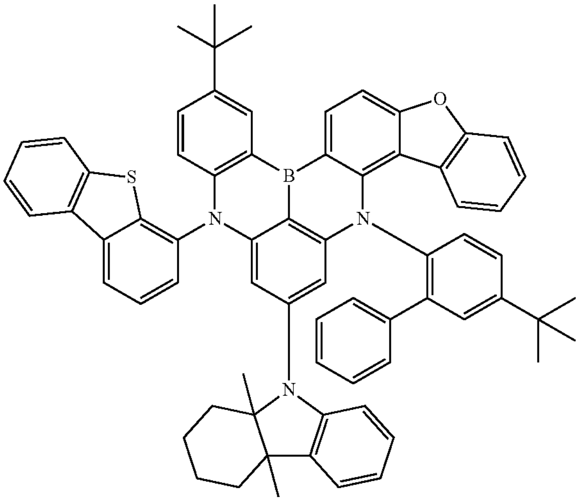
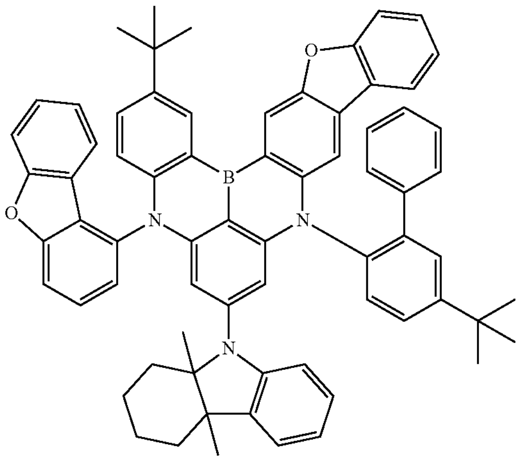
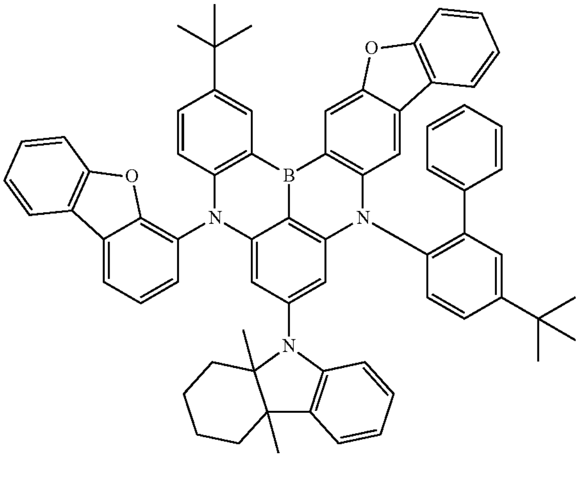

-continued
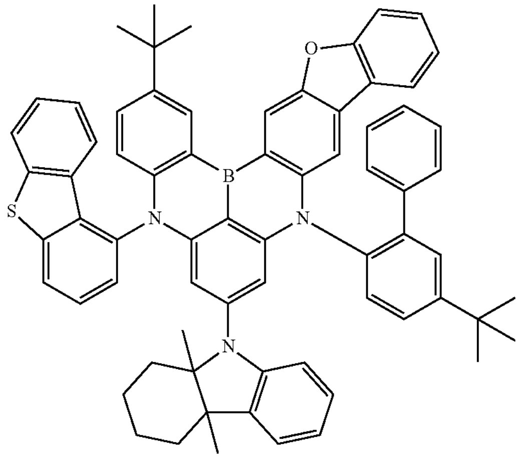
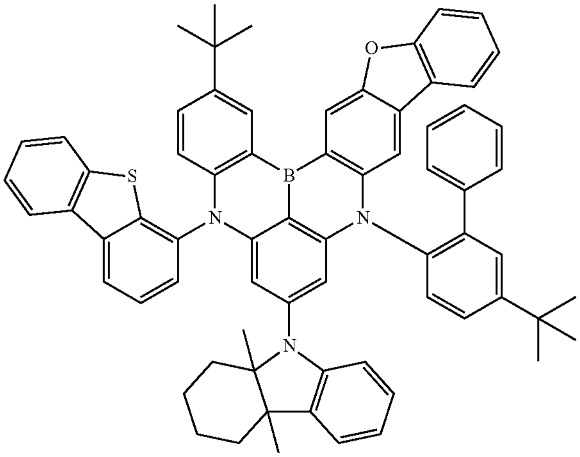
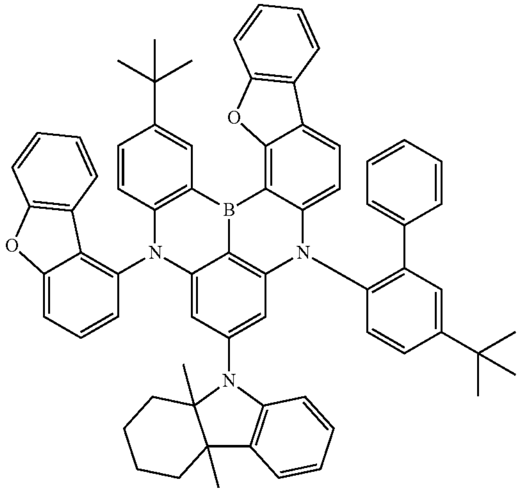
-continued
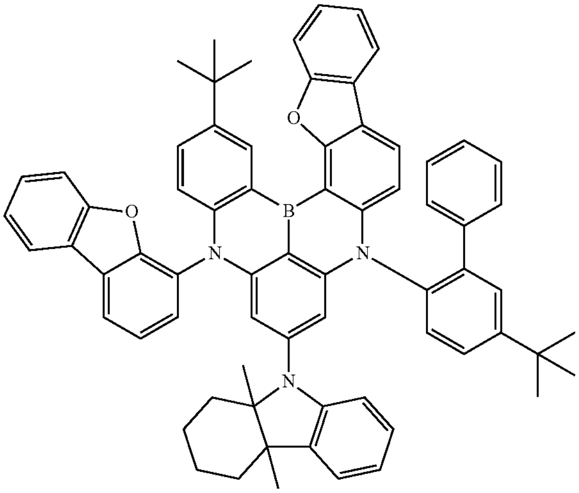
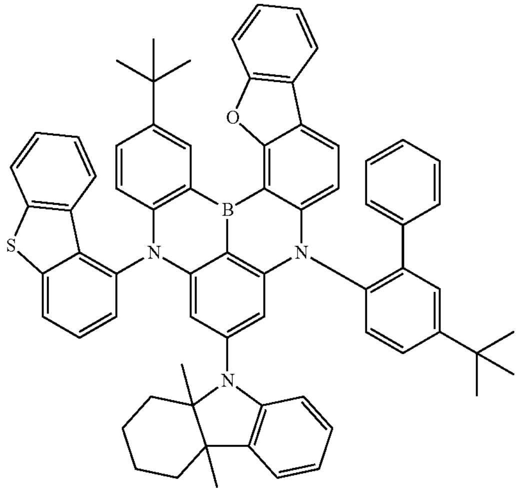
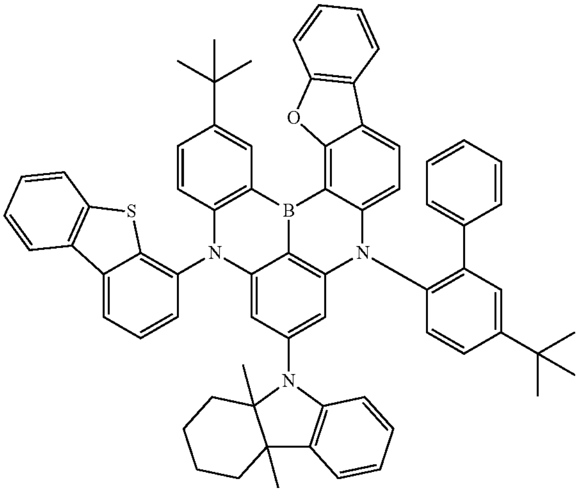

-continued
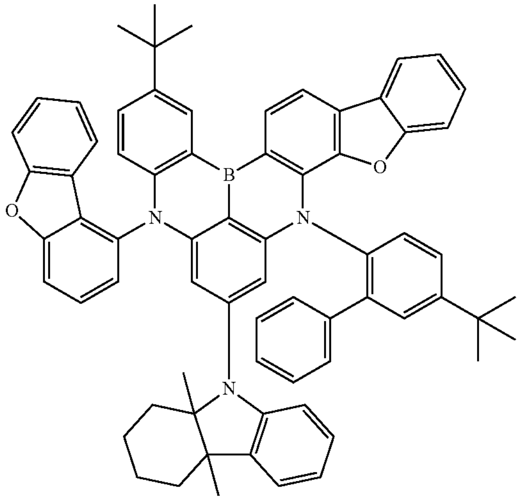
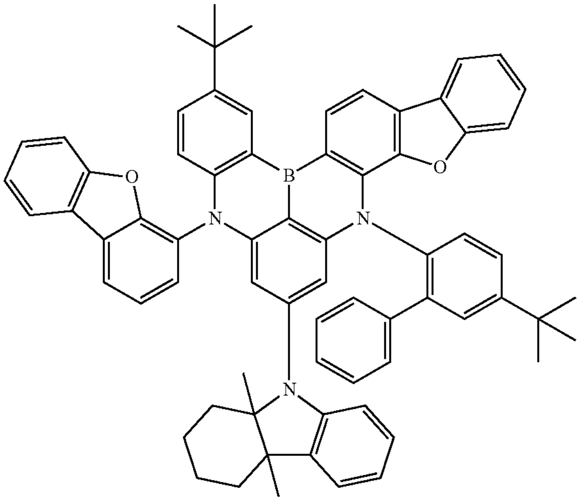
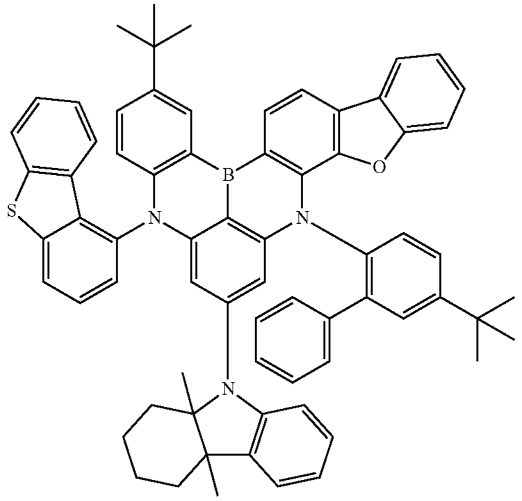
-continued
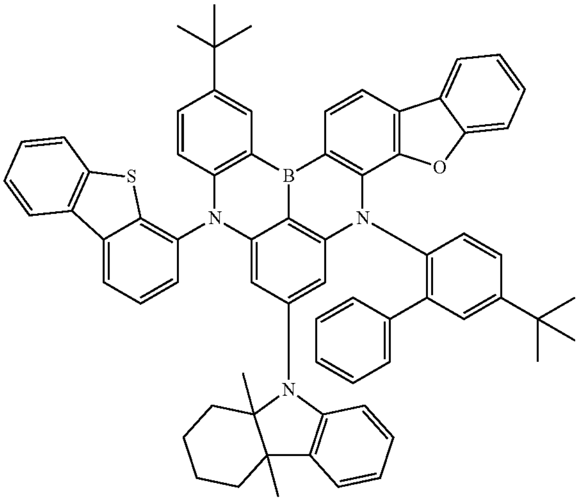
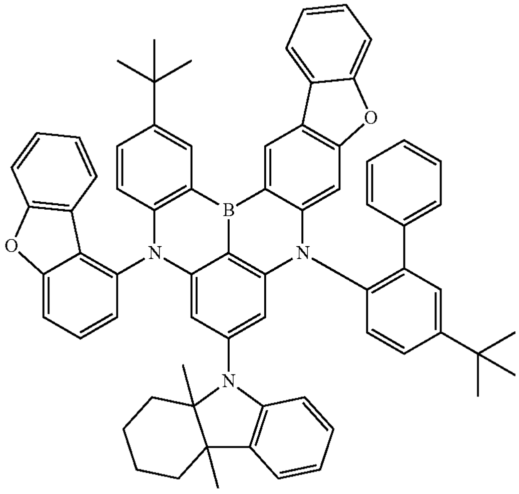
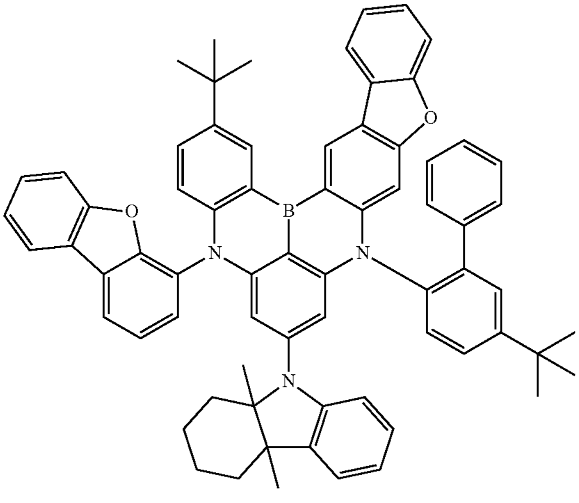

-continued
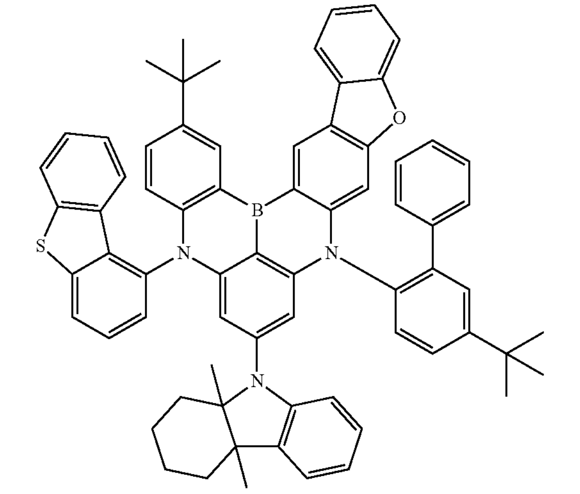
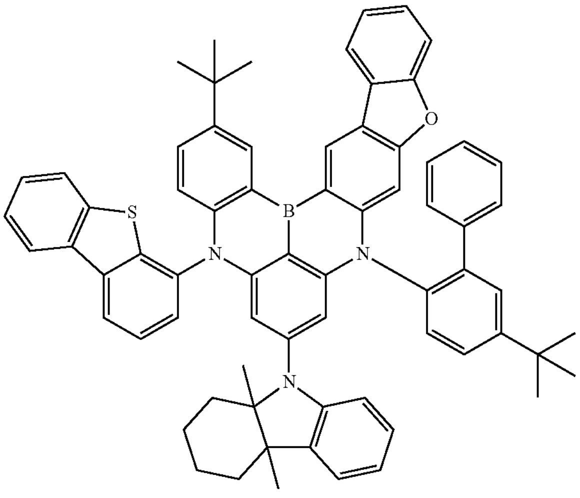
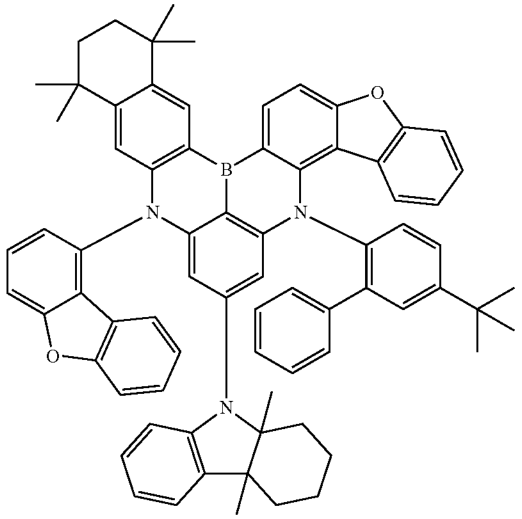
-continued
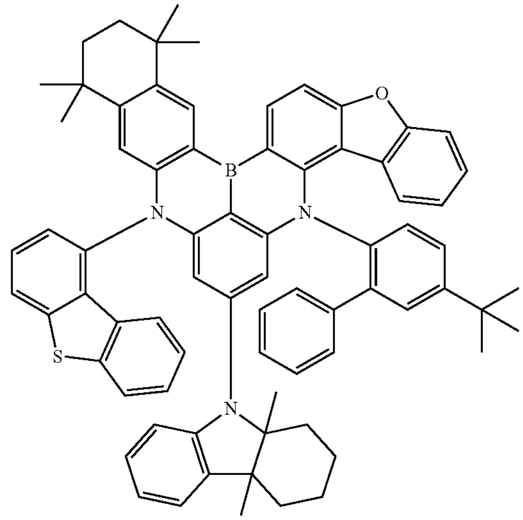
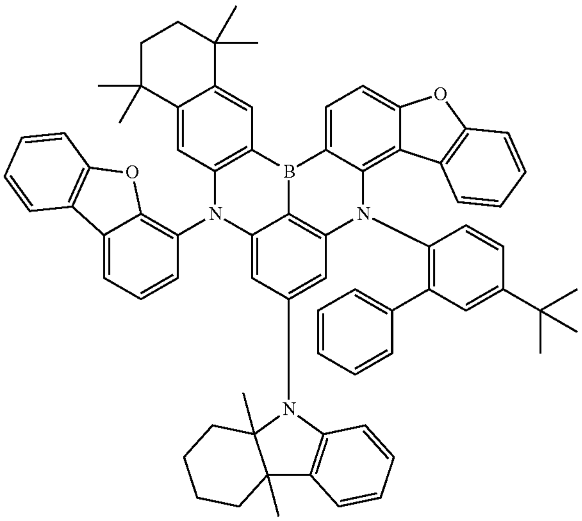
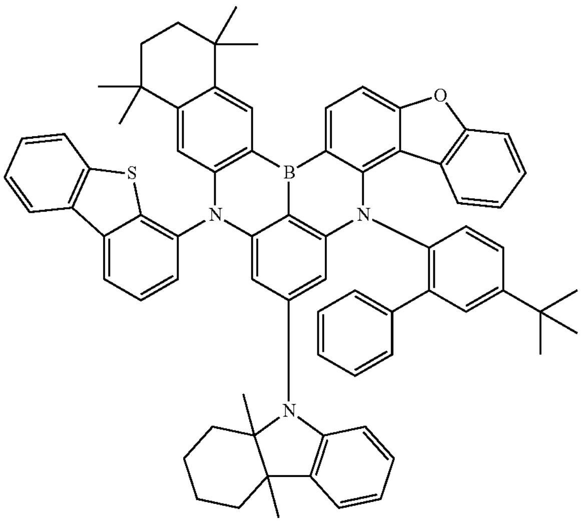

-continued
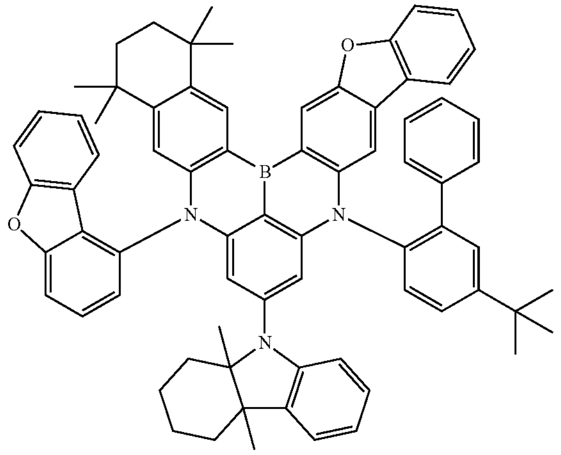
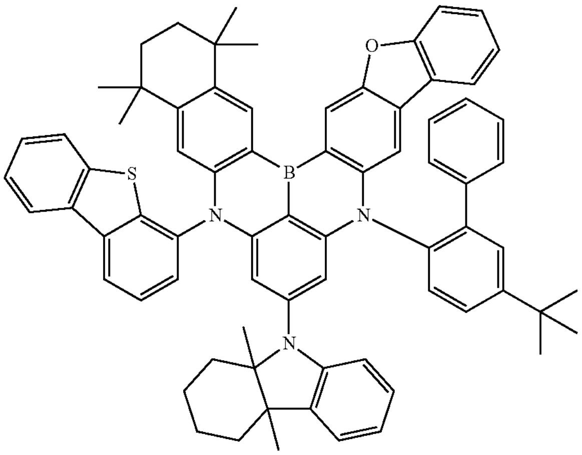
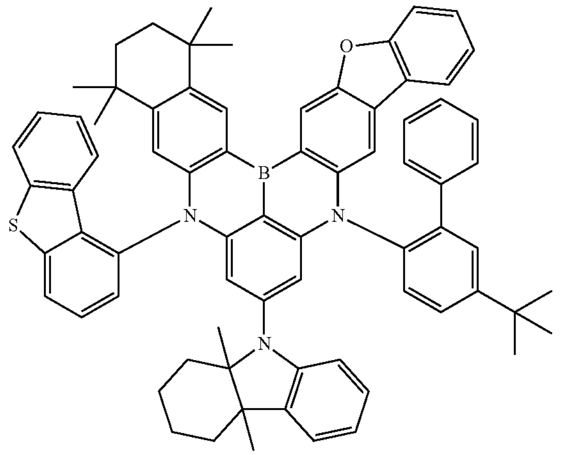
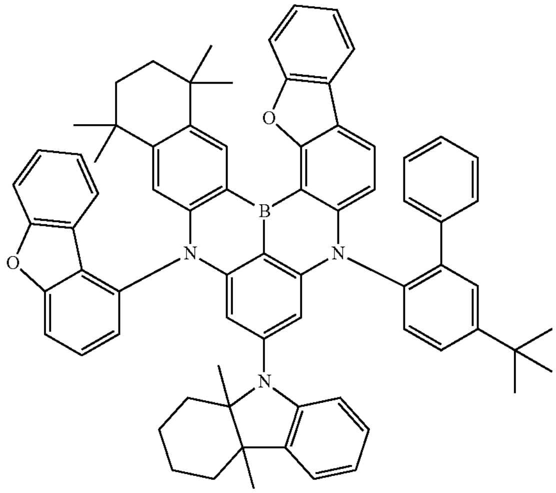
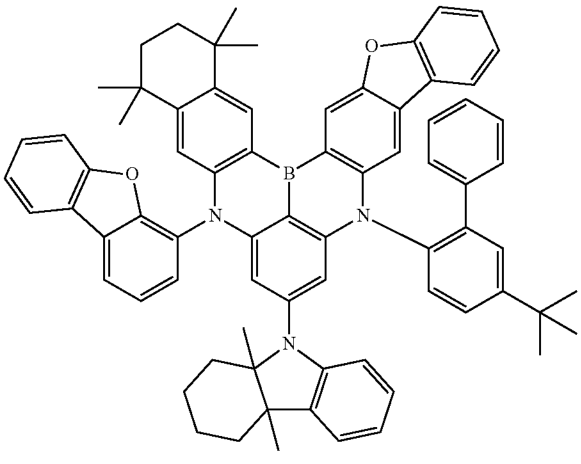
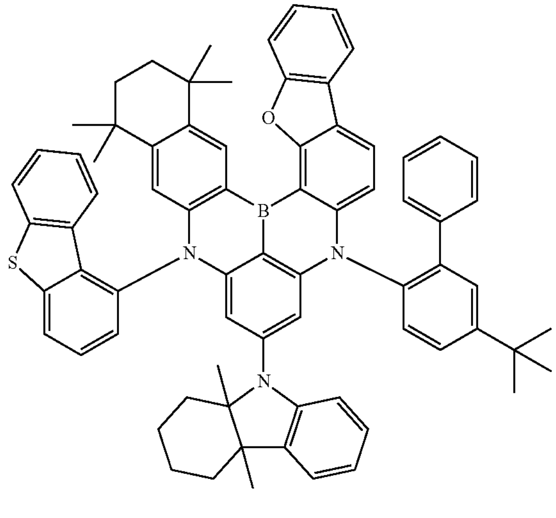
-continued -continued
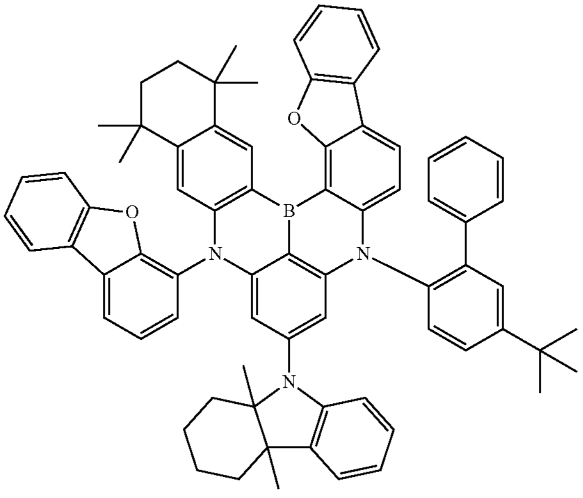
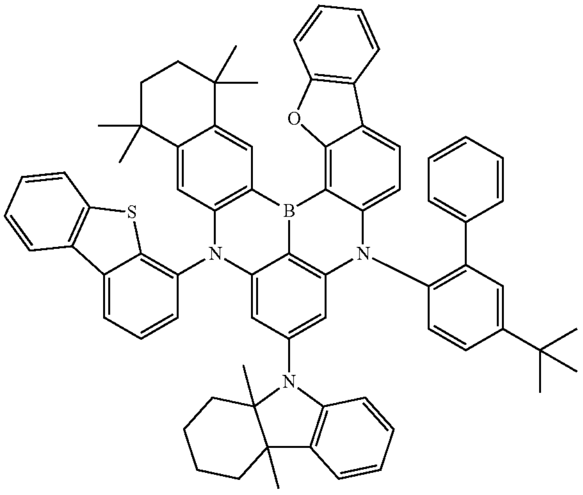
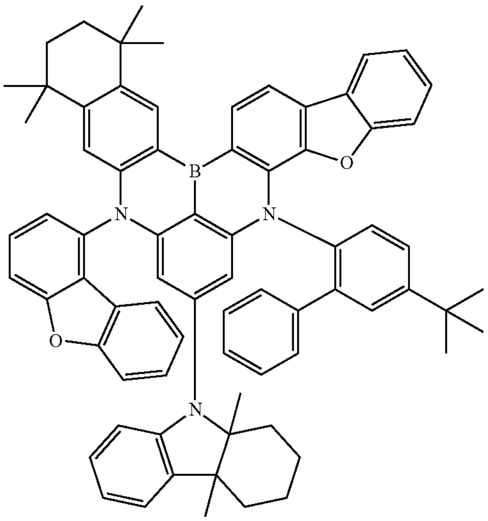
-continued
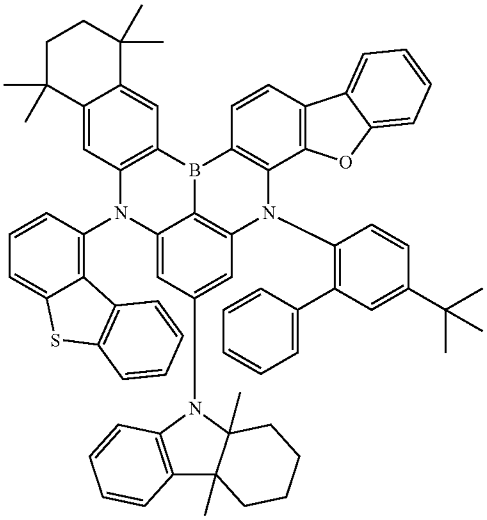
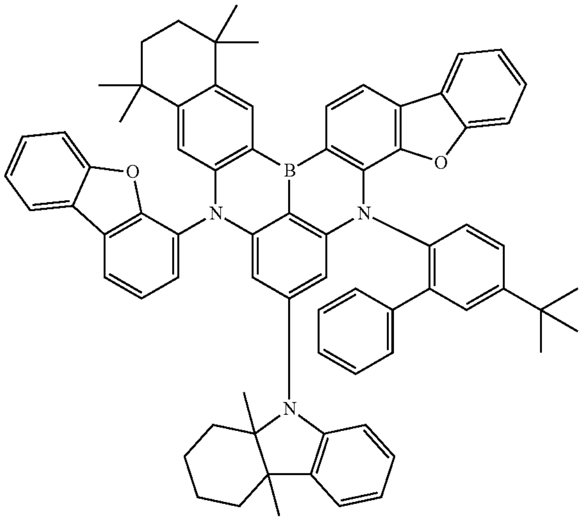
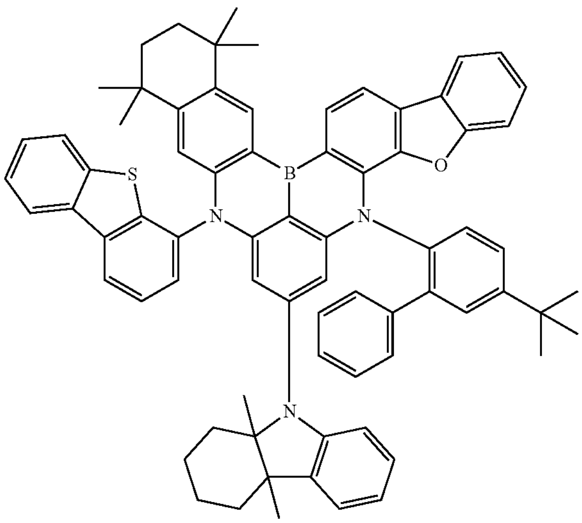

-continued
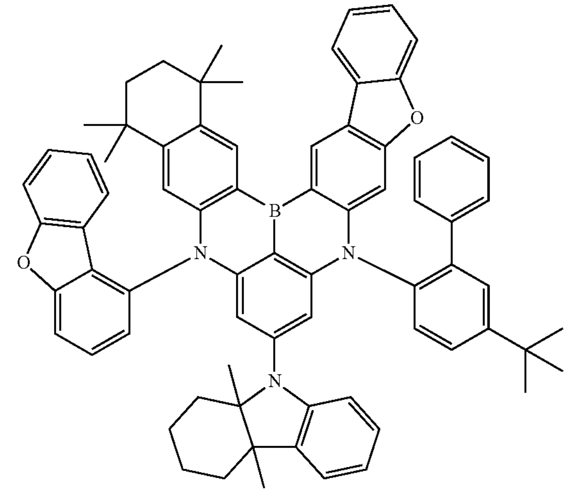
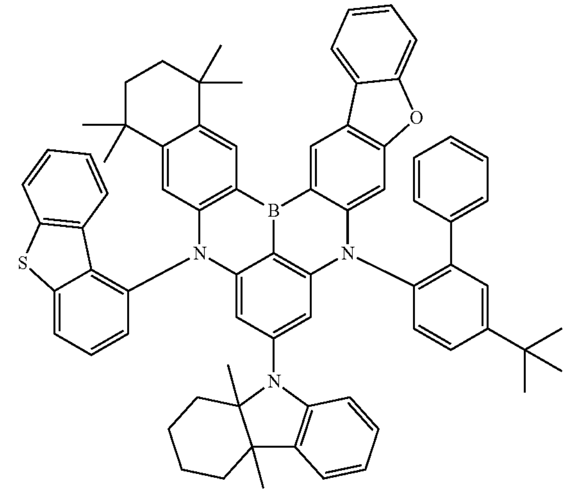
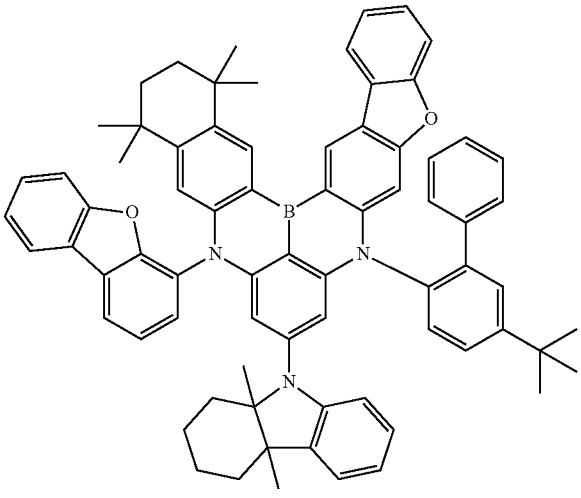
-continued
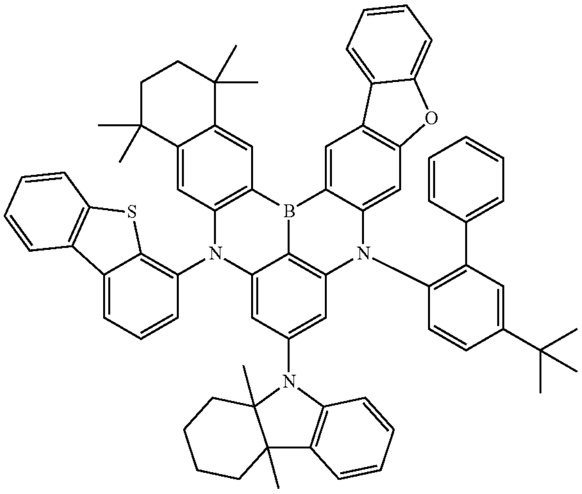
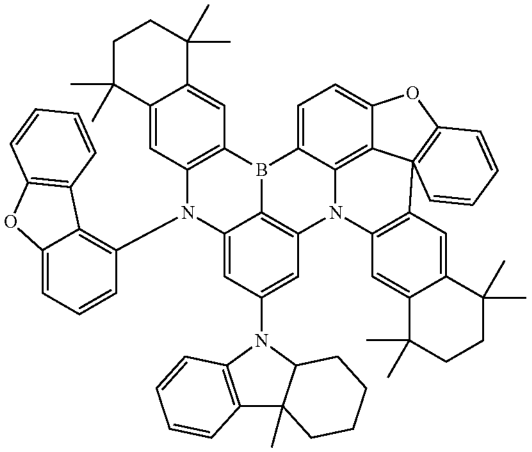
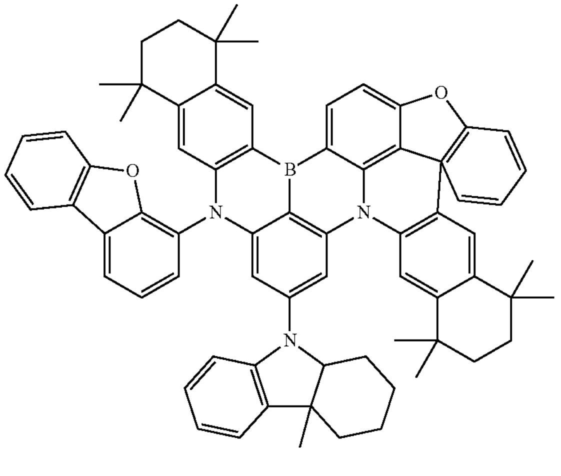

-continued
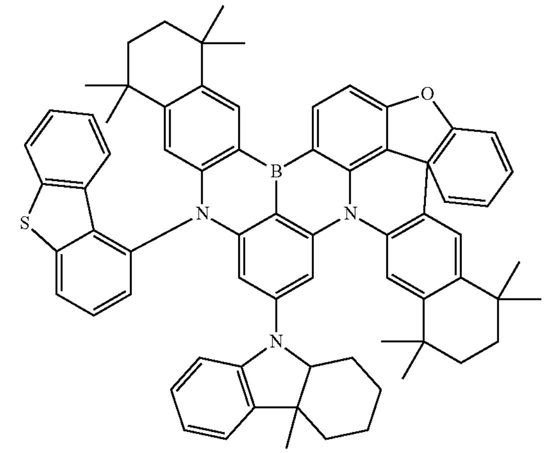
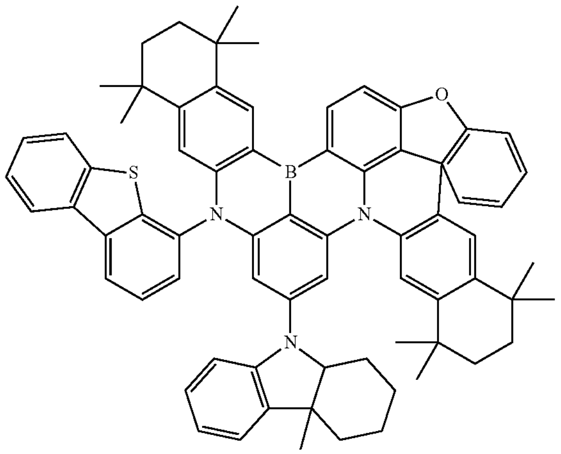
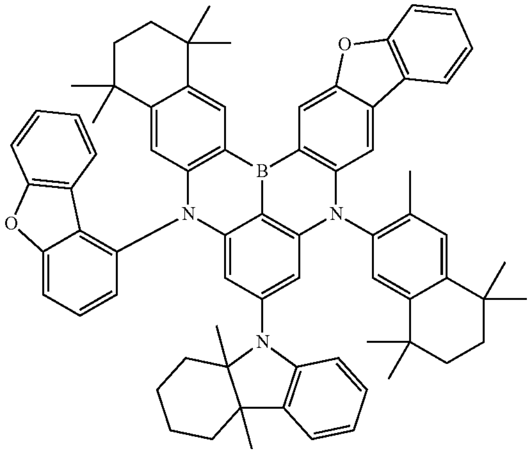
-continued
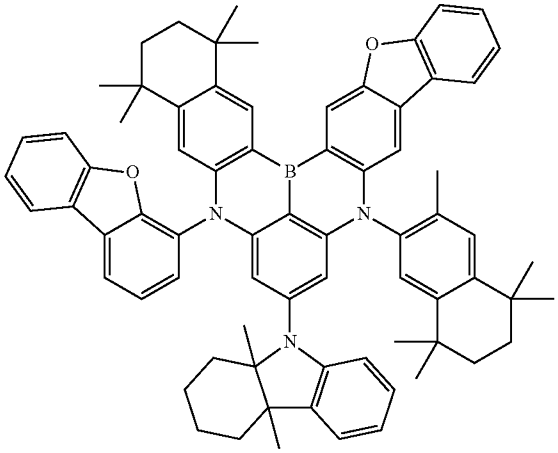
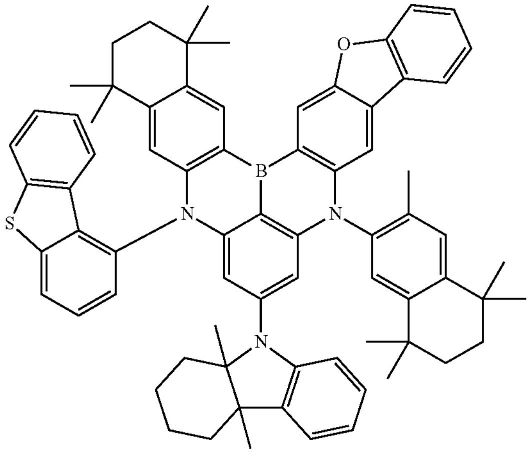
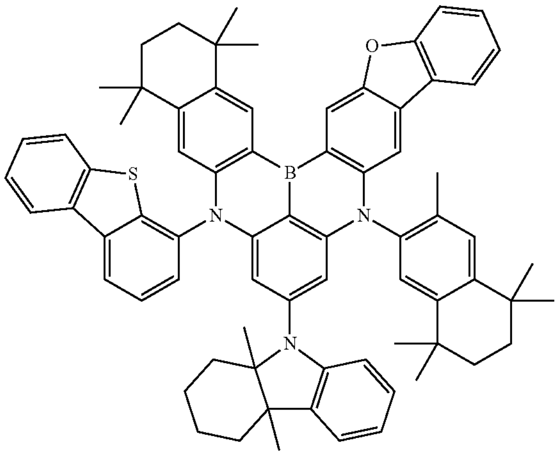

-continued
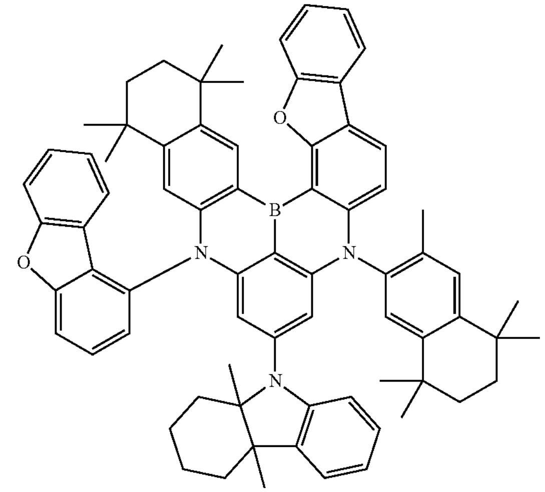
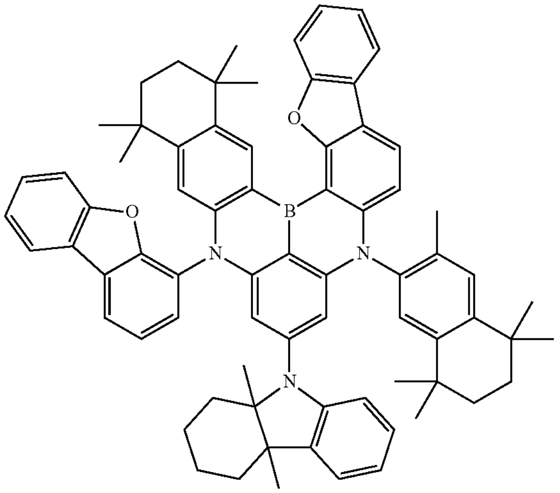
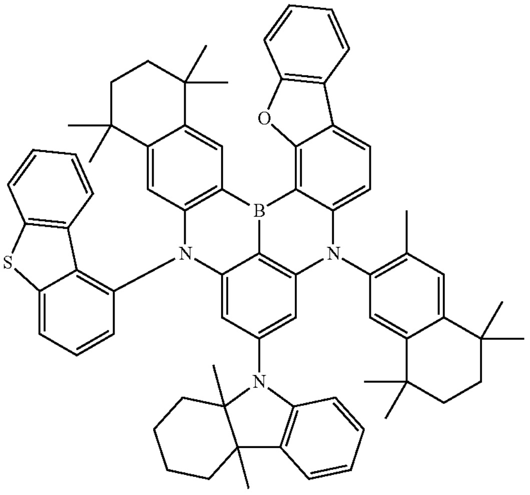
-continued
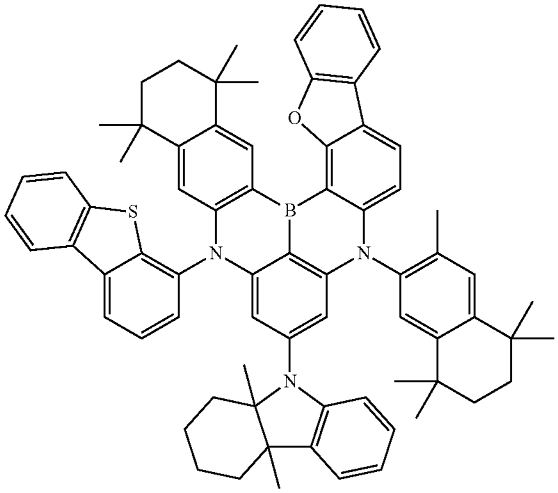
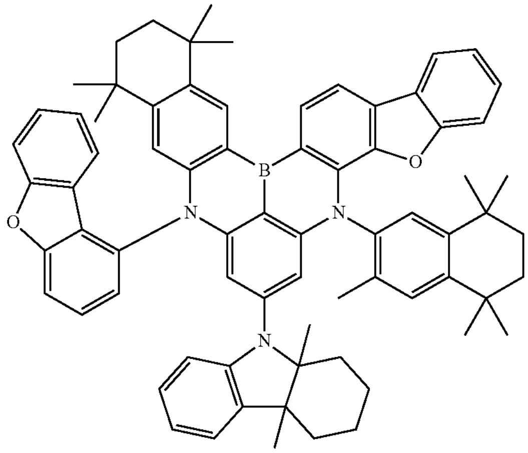
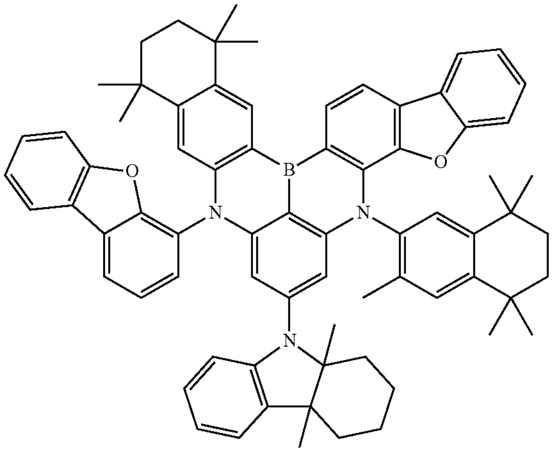

-continued
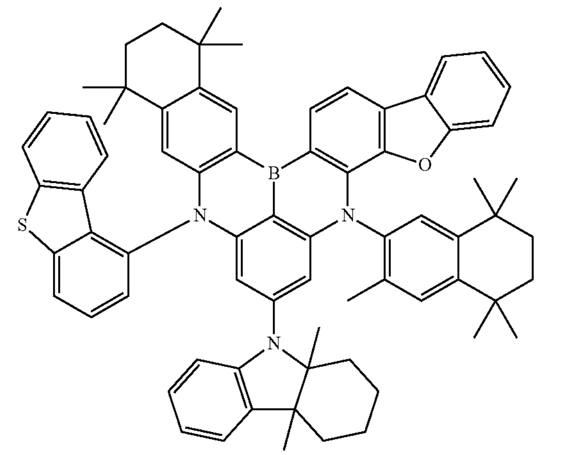
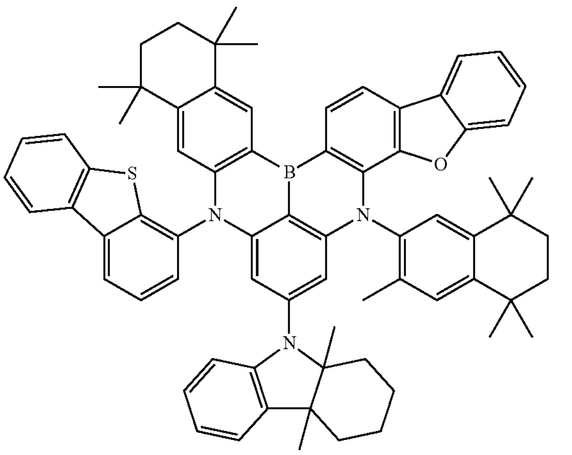
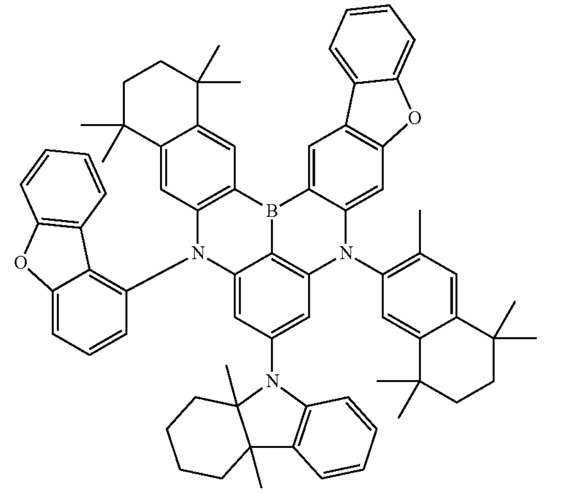
-continued
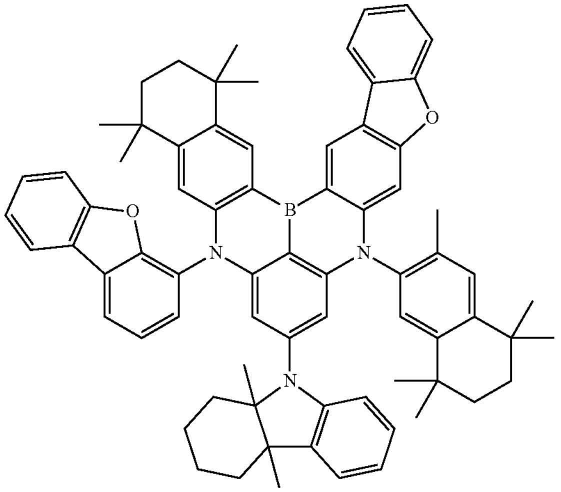
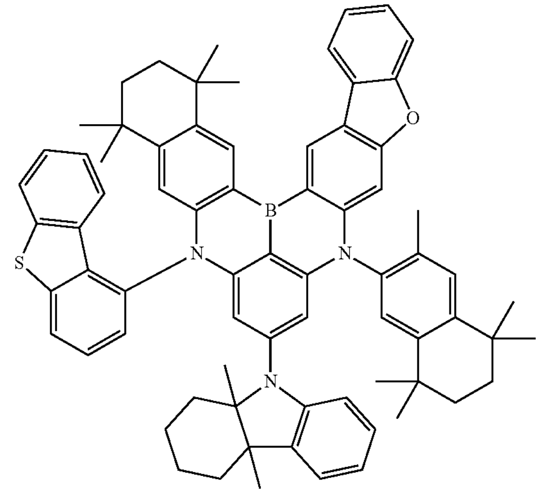
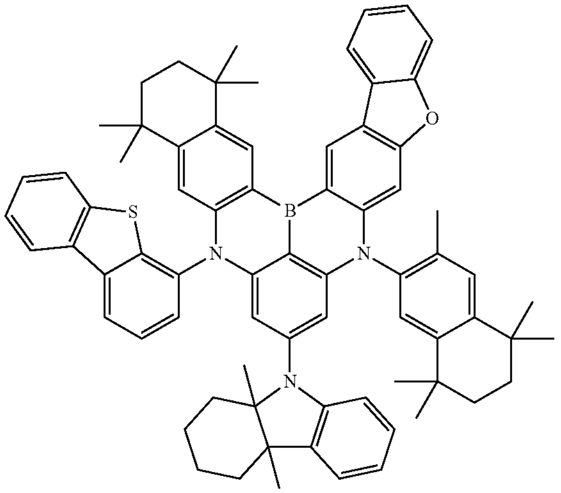

-continued
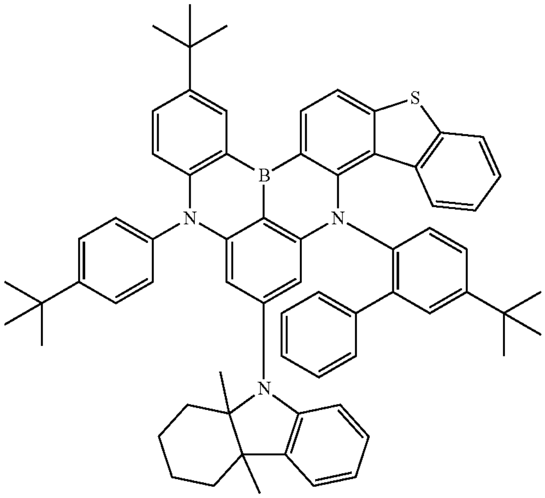
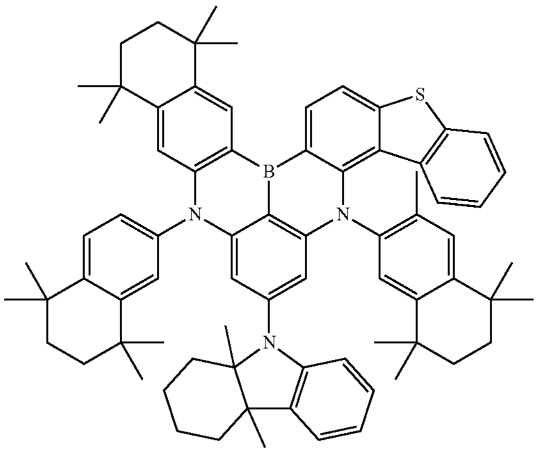
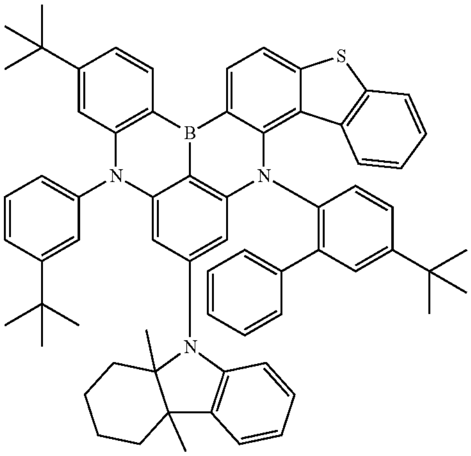
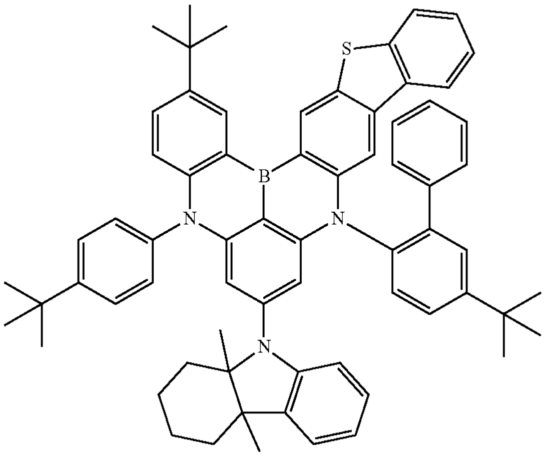
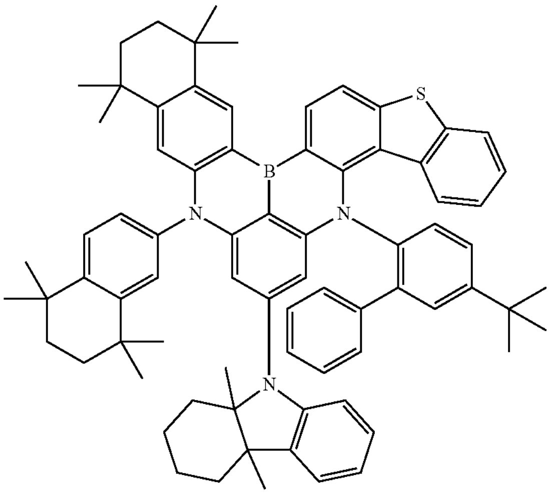
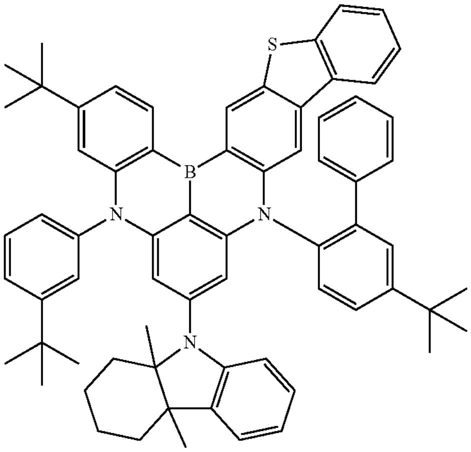

-continued
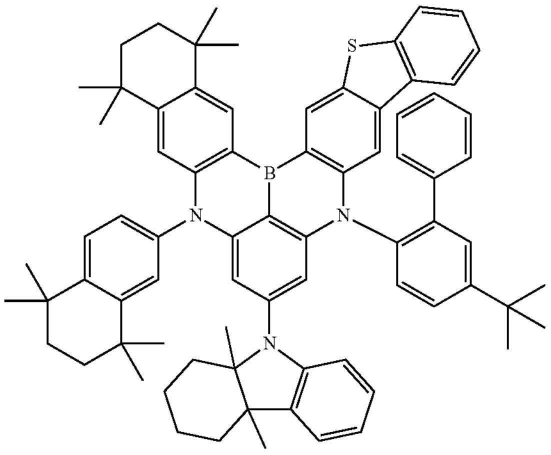
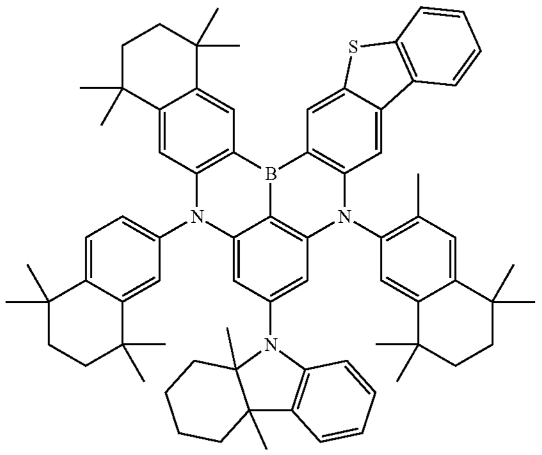
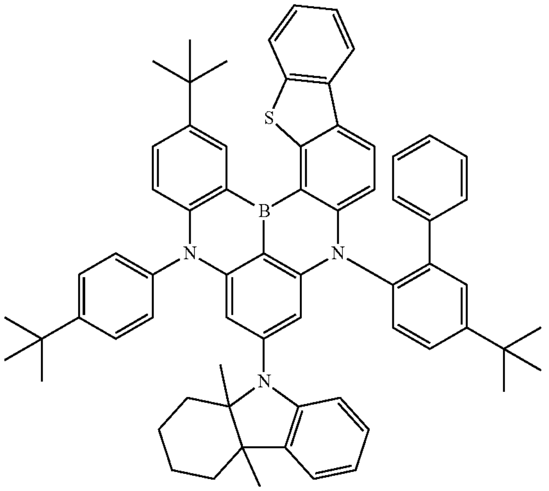
-continued
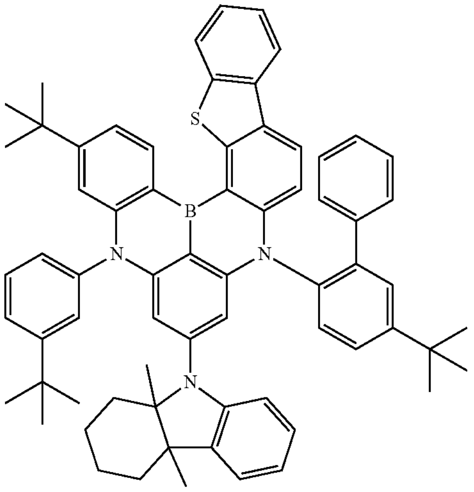
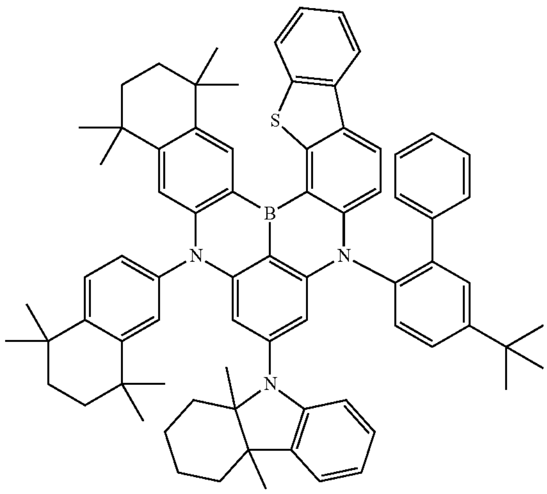
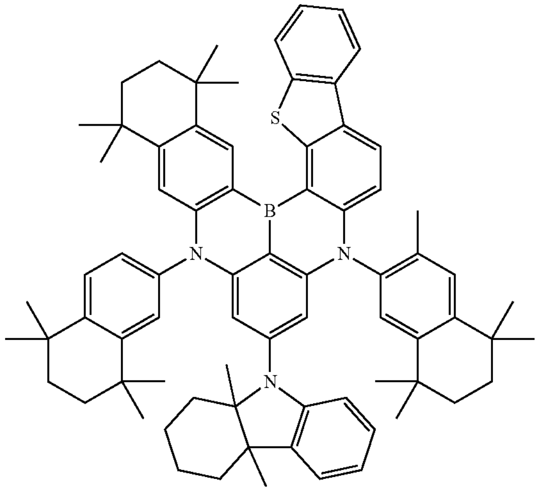

-continued
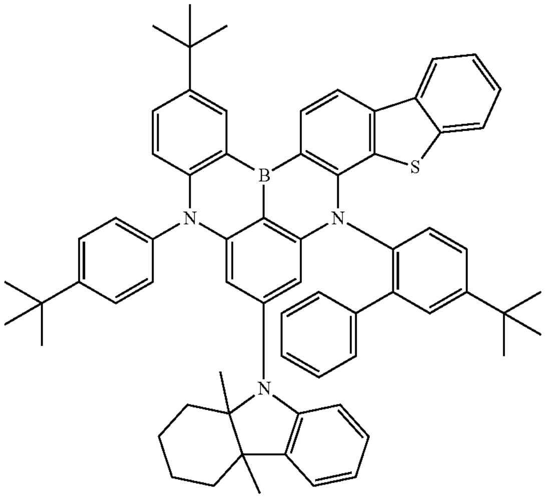
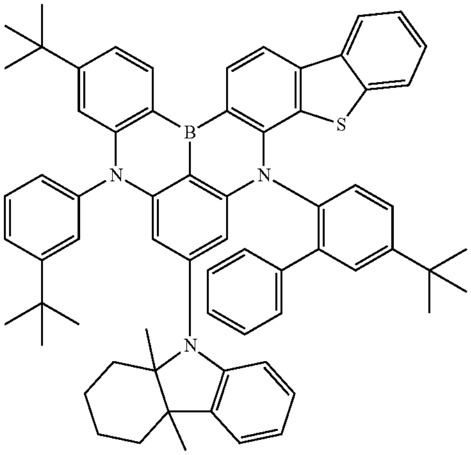
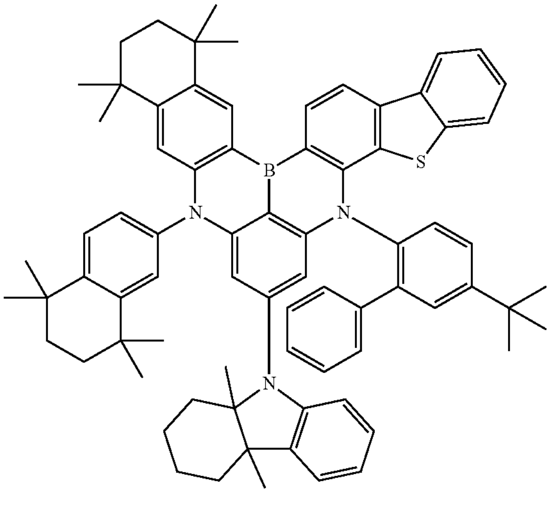
-continued
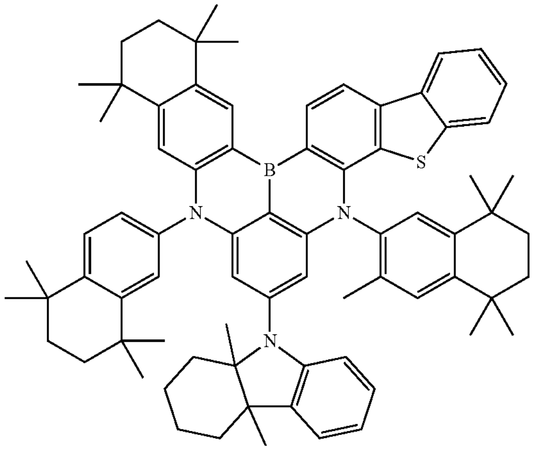
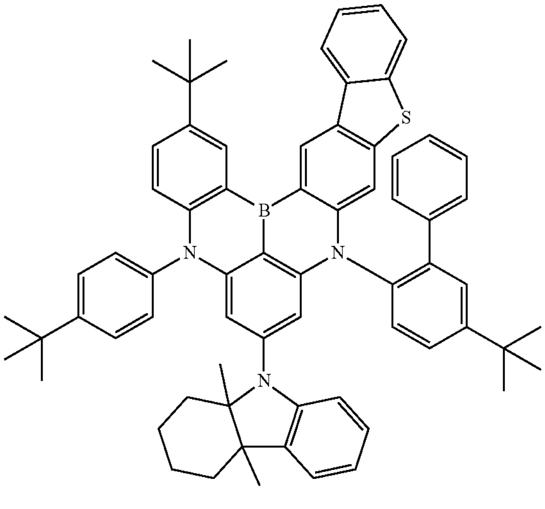
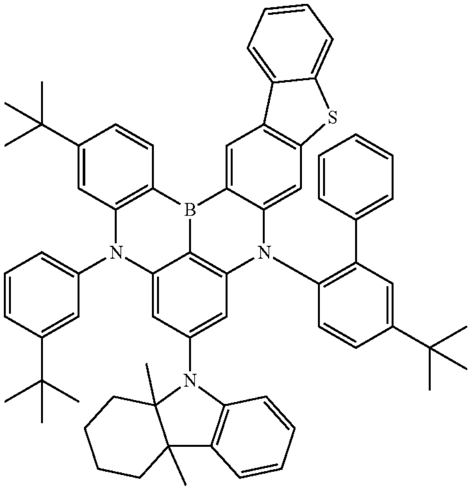

-continued
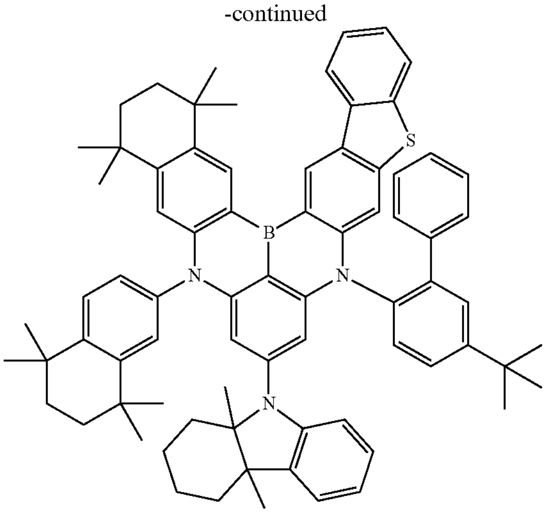
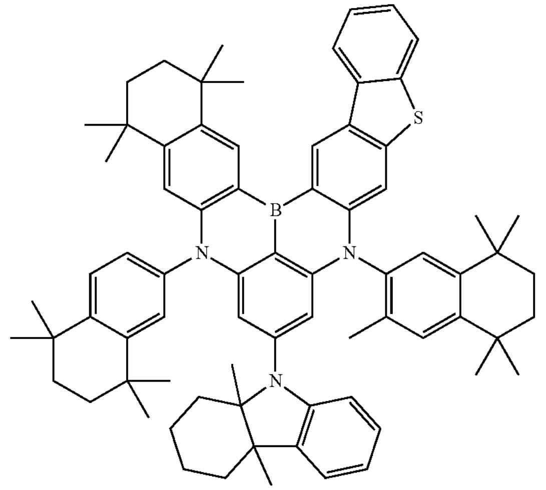
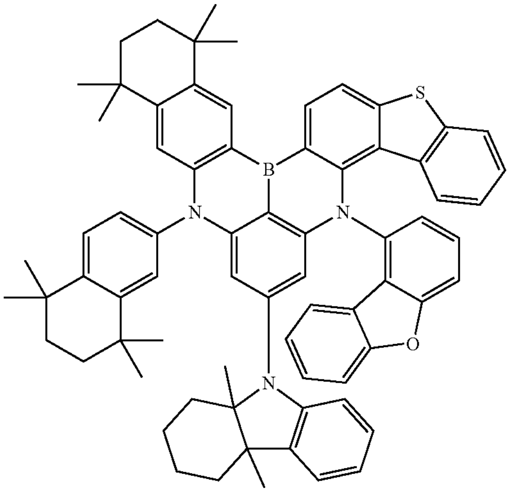
-continued
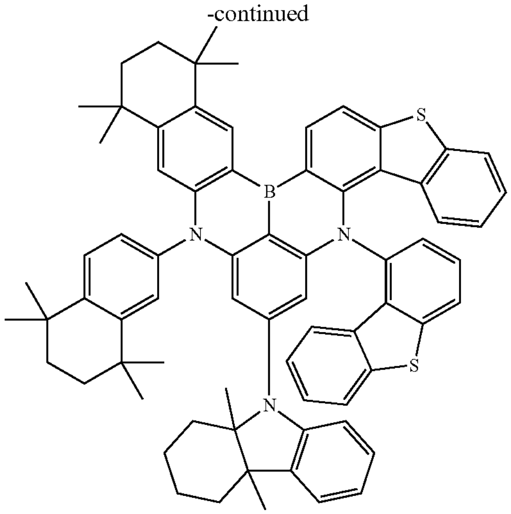
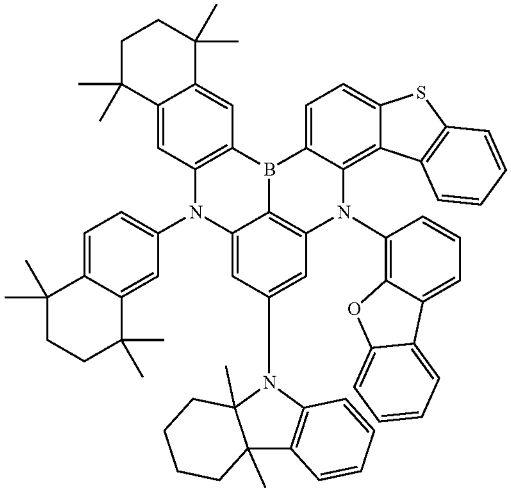
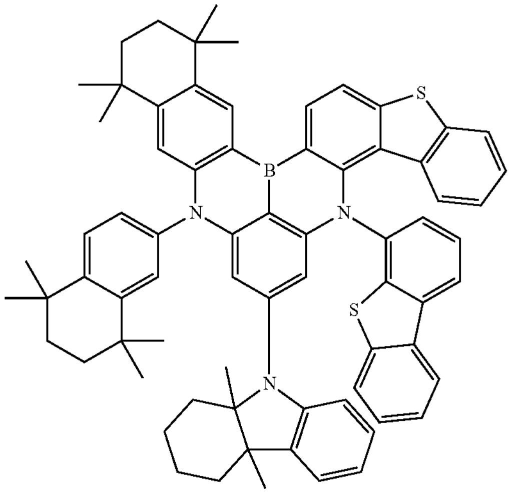

-continued
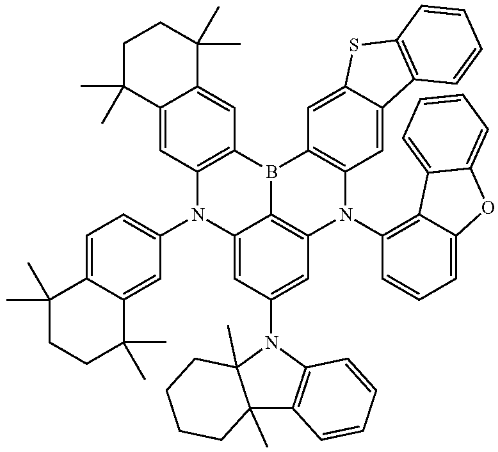
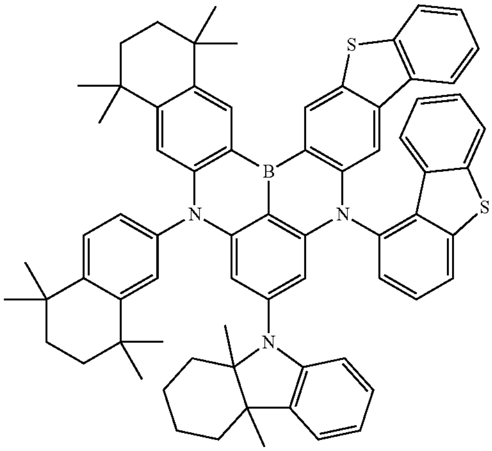
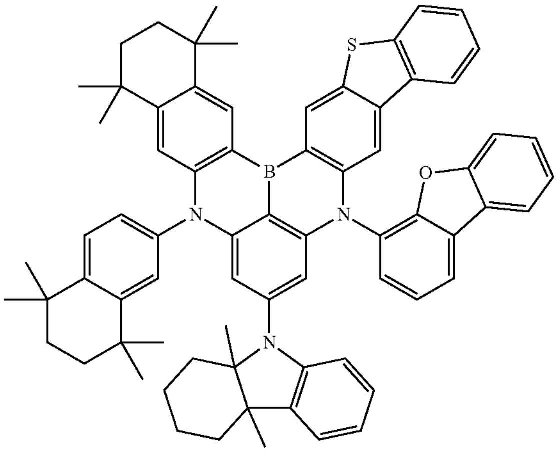
-continued
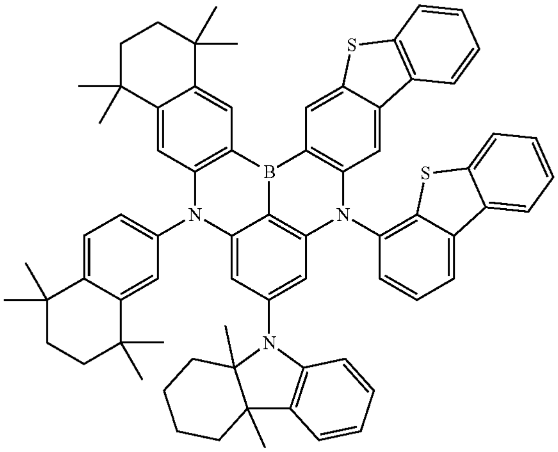
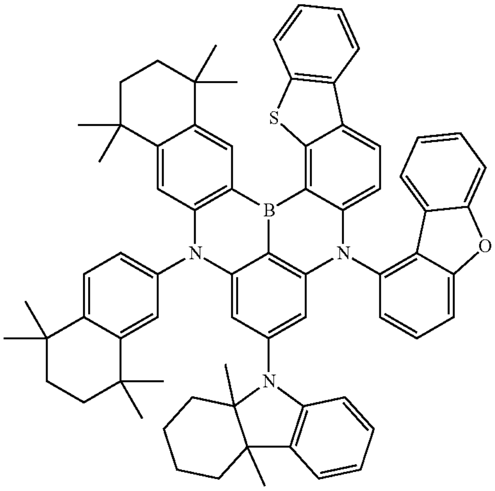
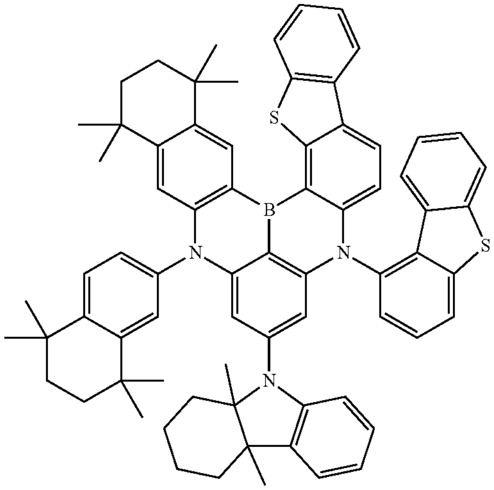

-continued
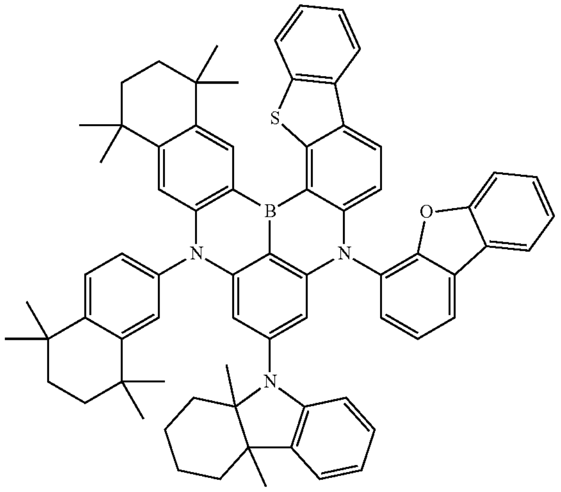
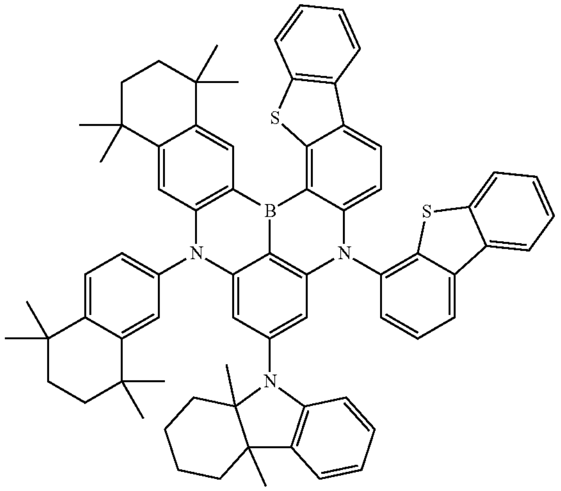
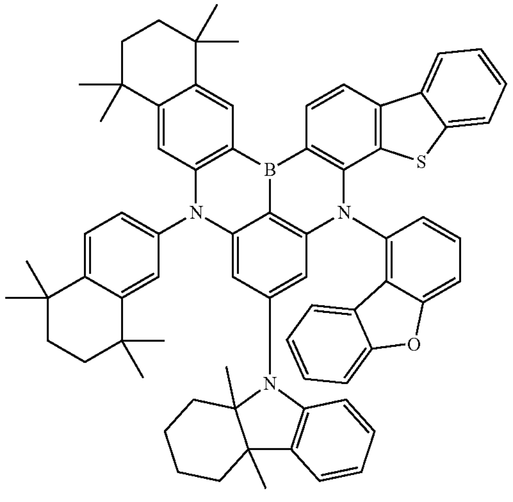
-continued
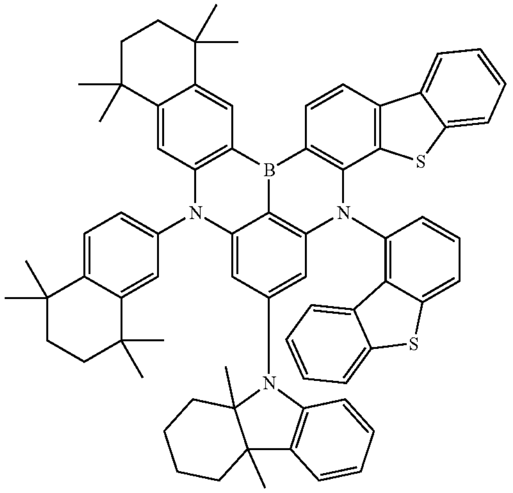
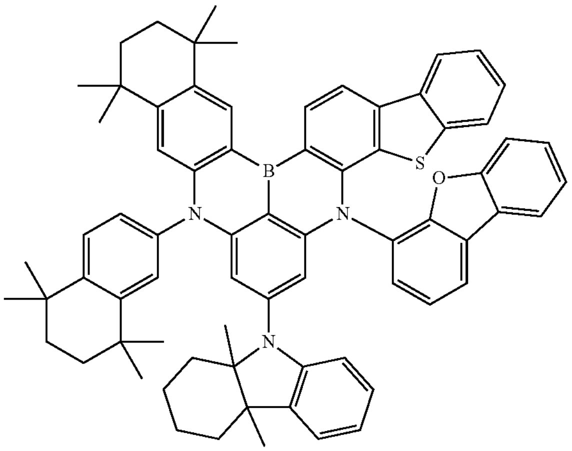
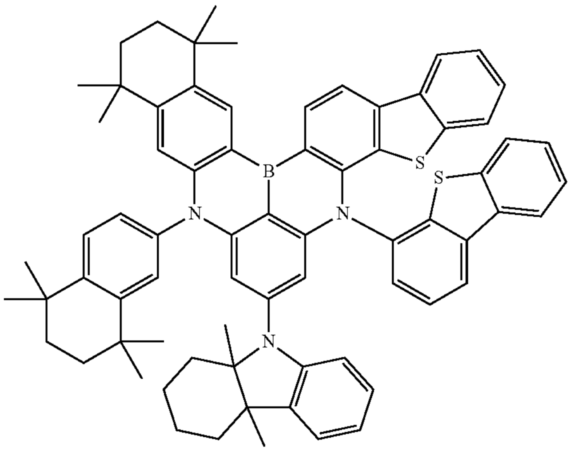

-continued
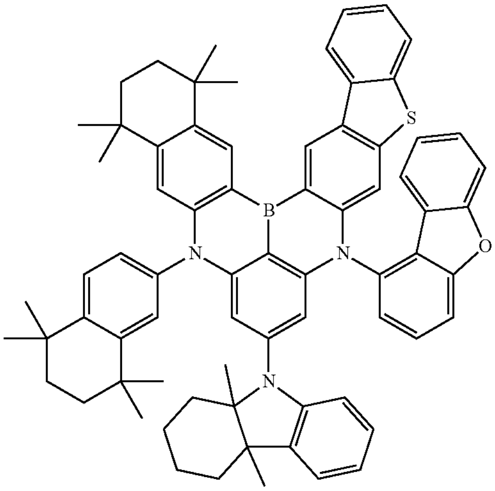
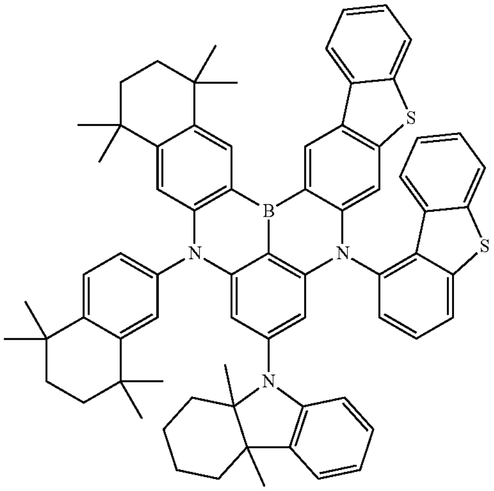
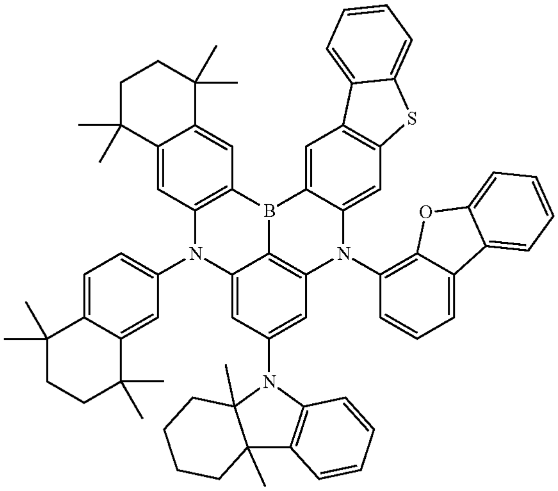
-continued
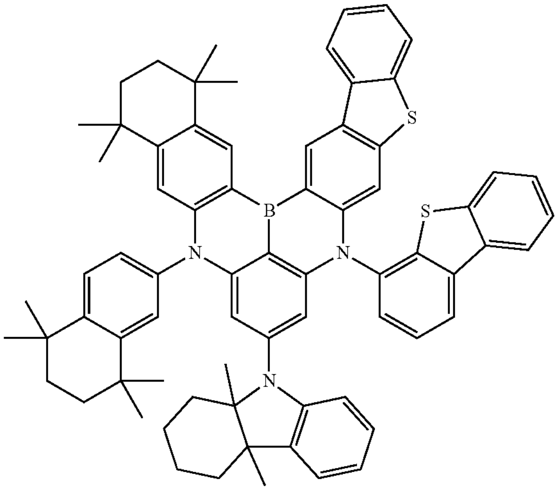
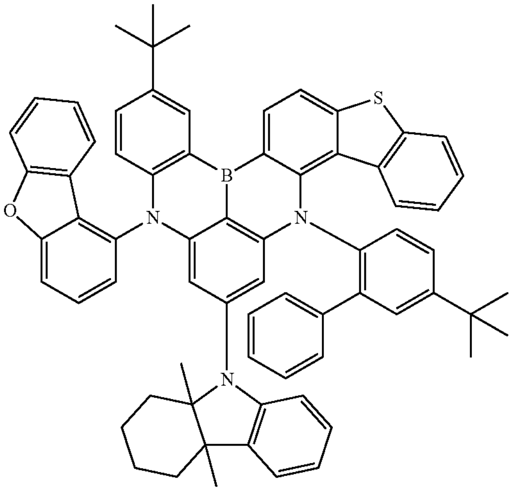
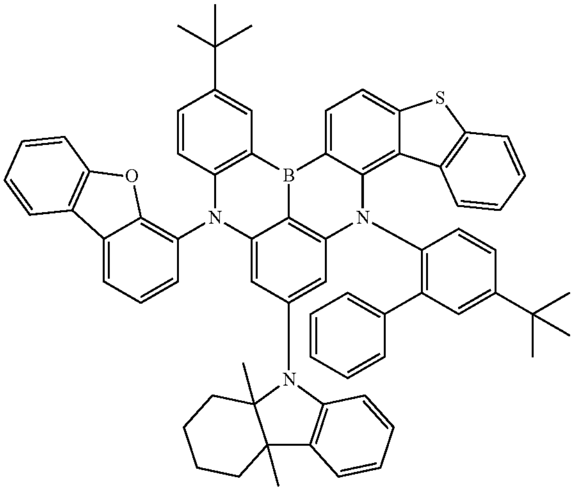

-continued
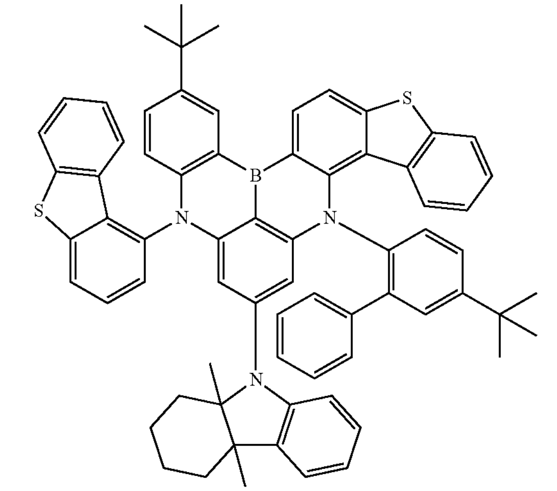
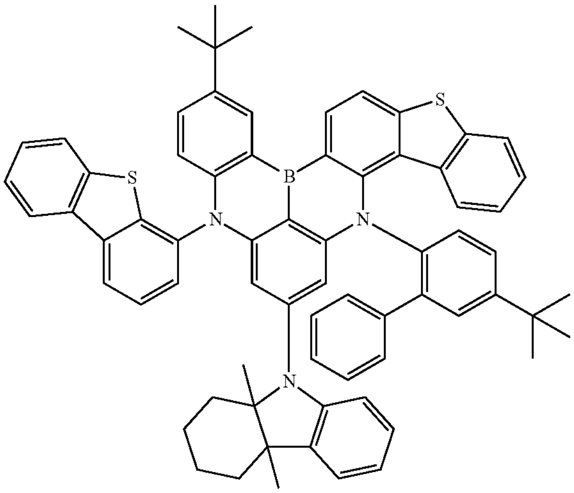
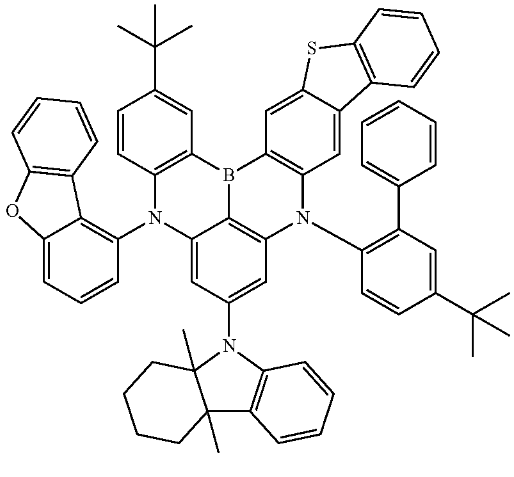
-continued
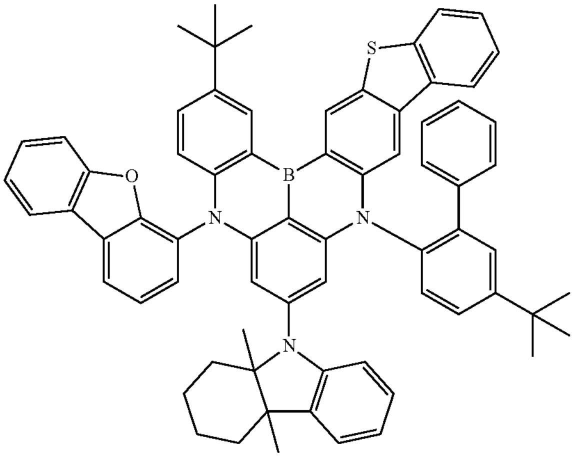
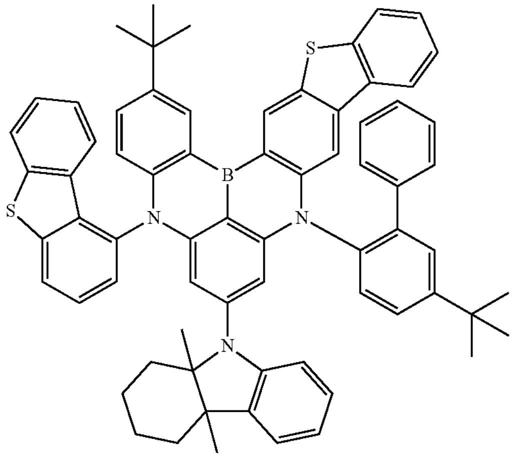
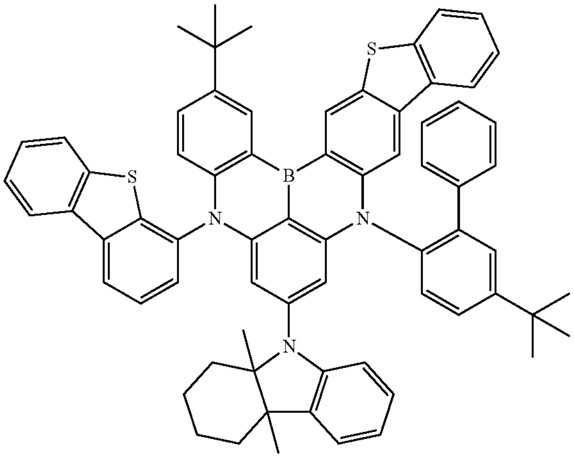

-continued
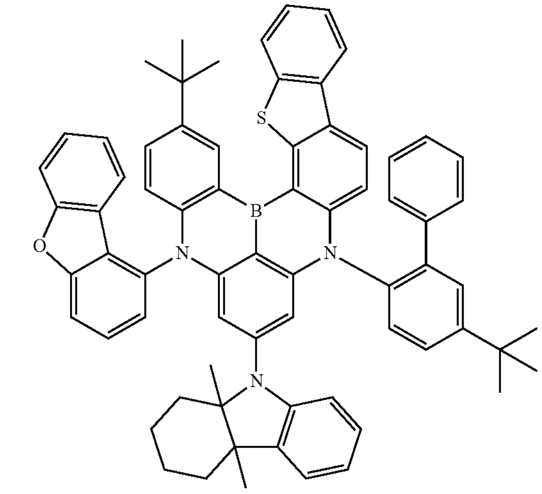
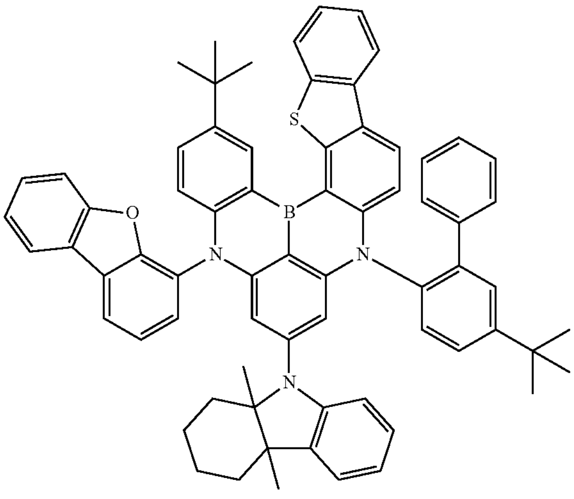
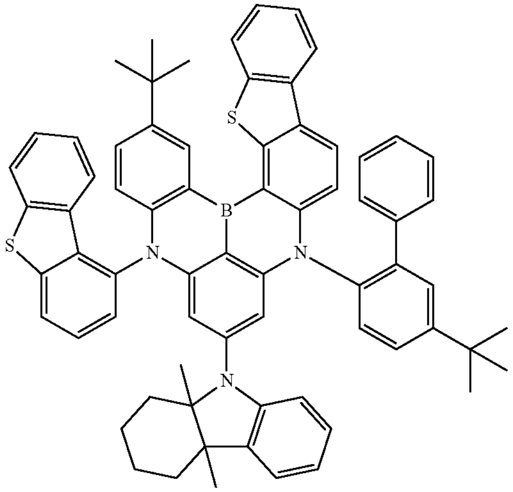
-continued
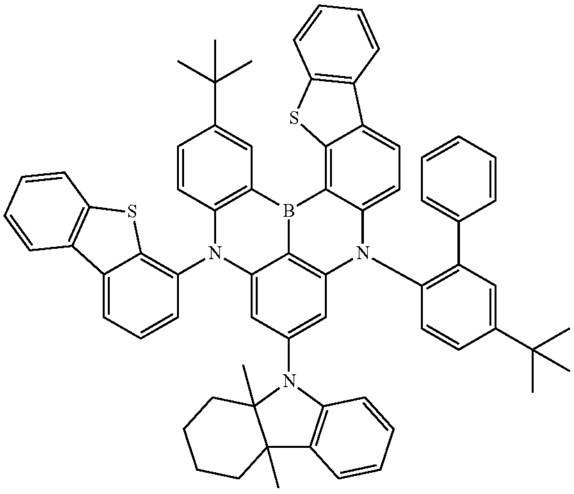
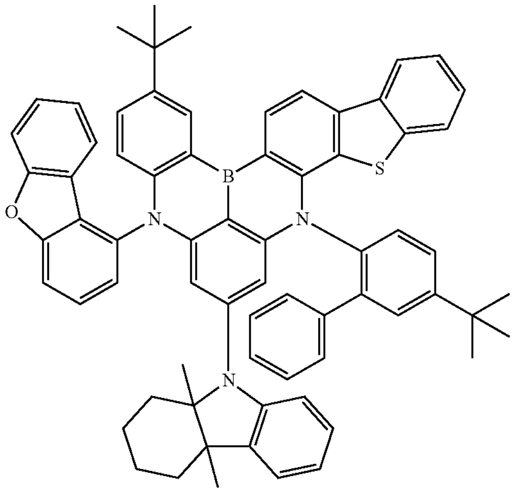
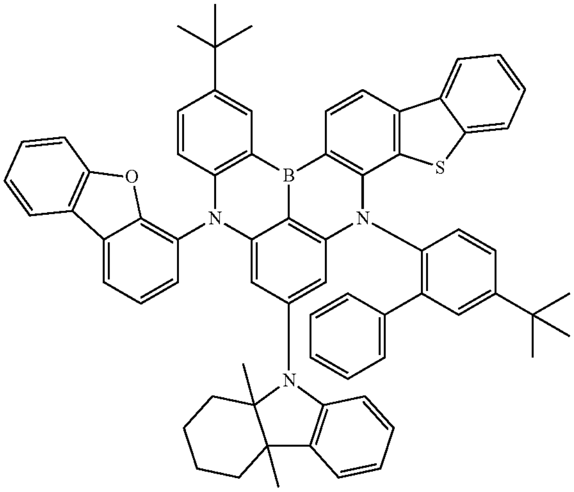

-continued
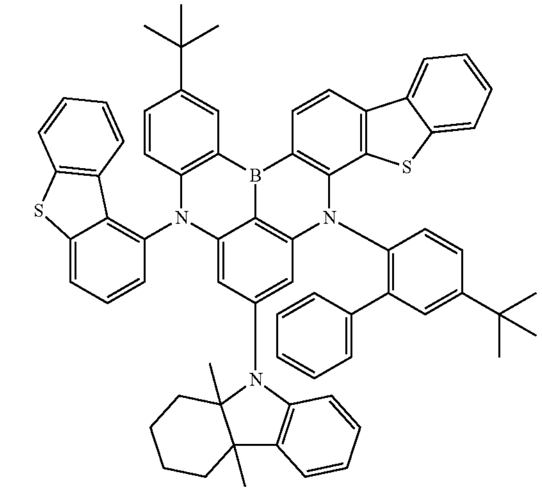
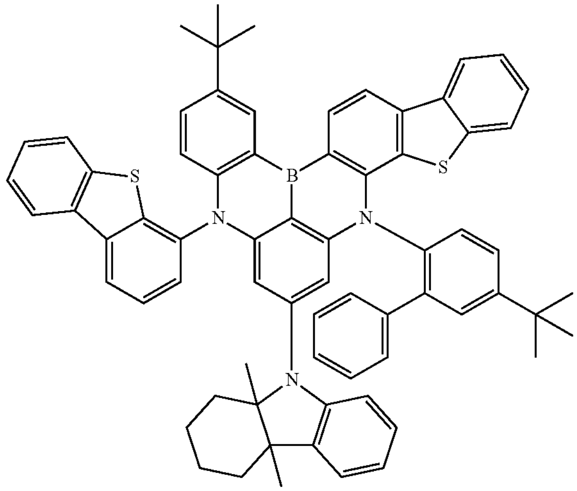
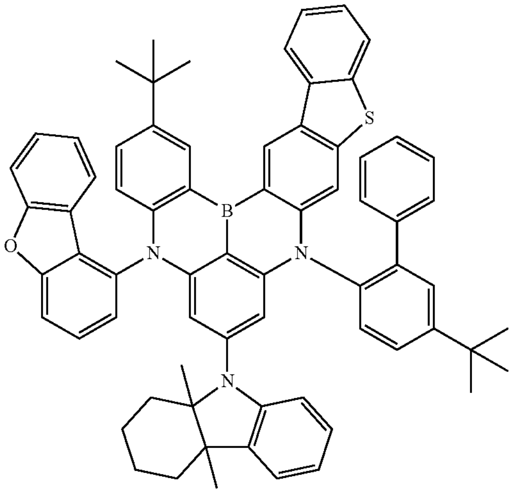
-continued
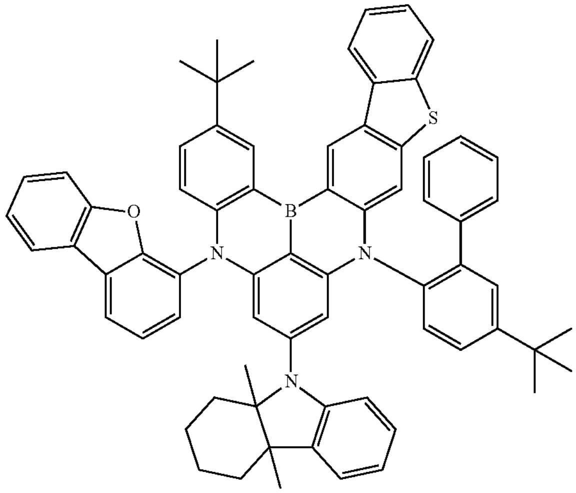
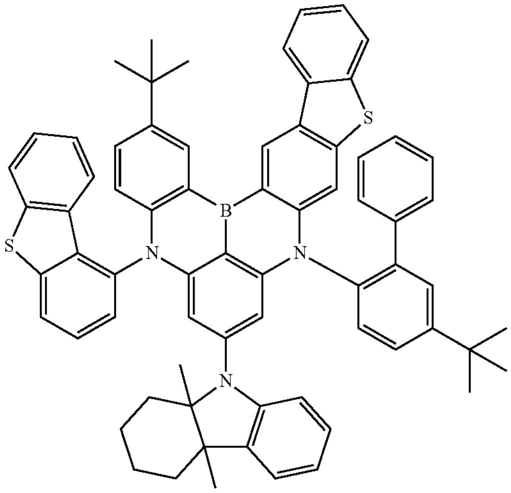
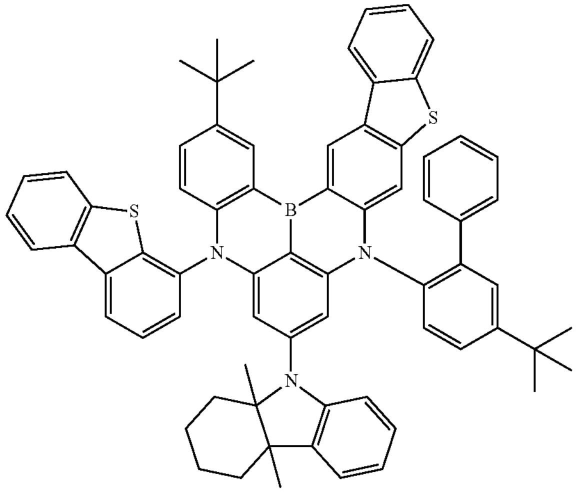

-continued
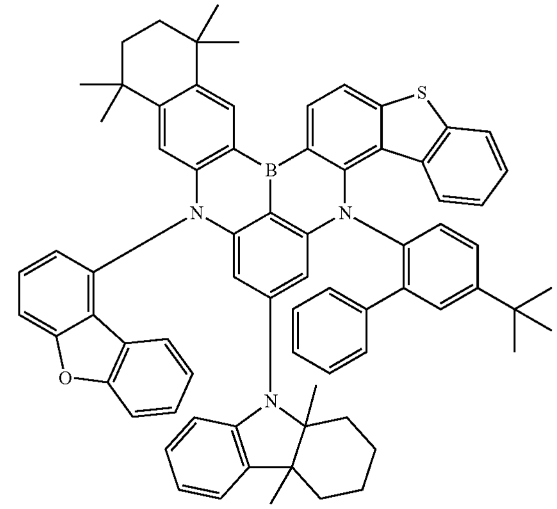
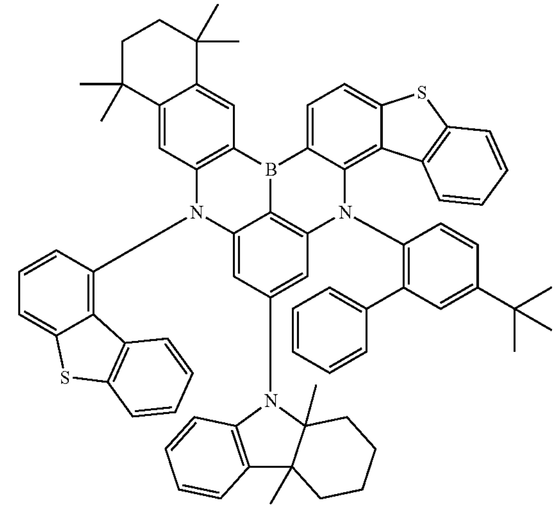
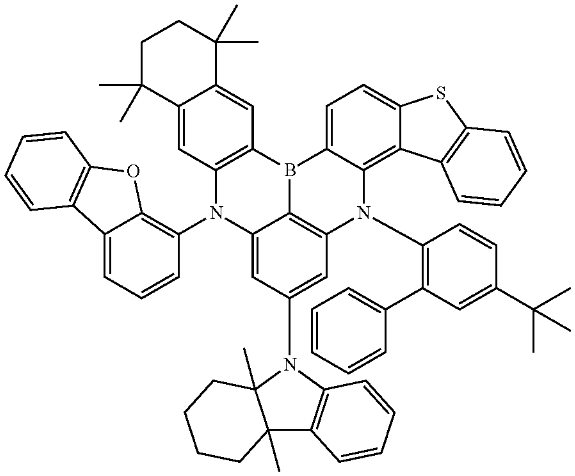
-continued
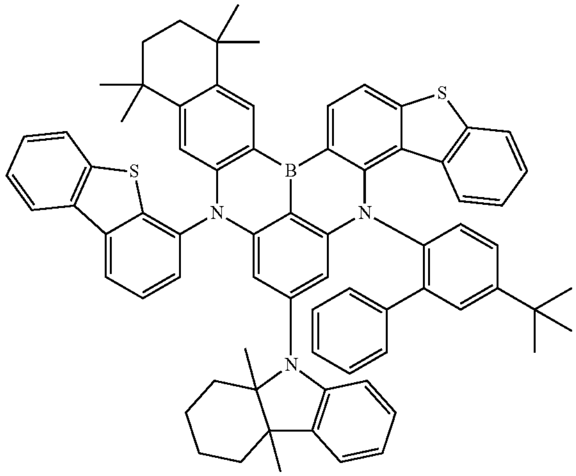
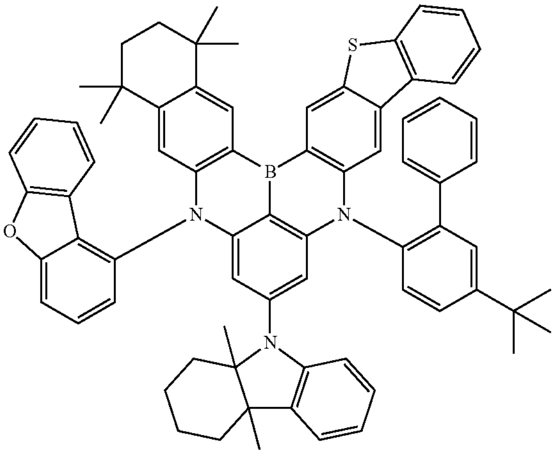
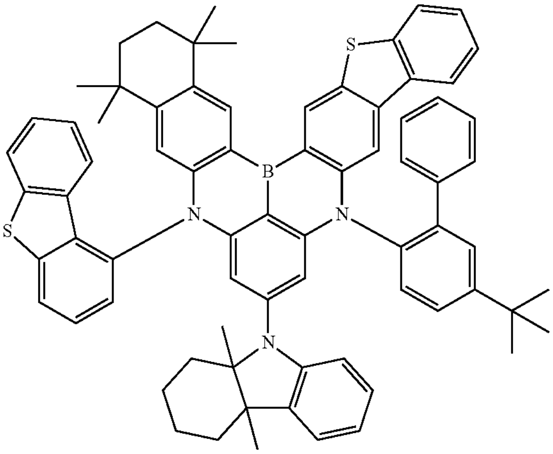

-continued
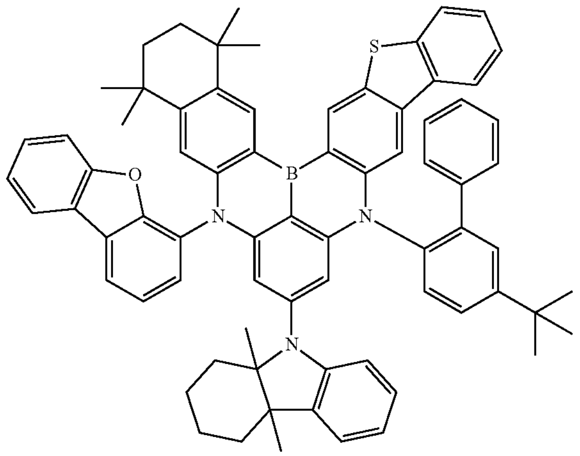
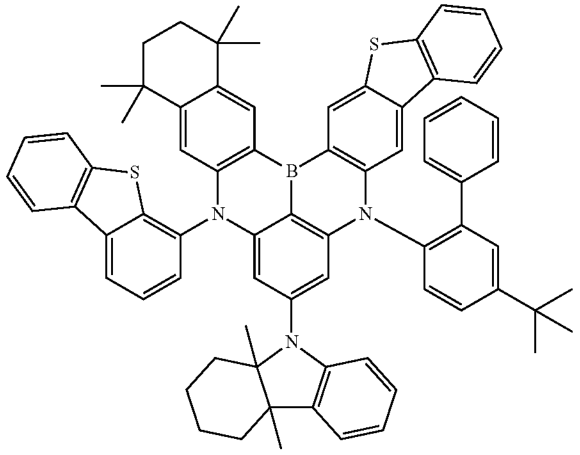
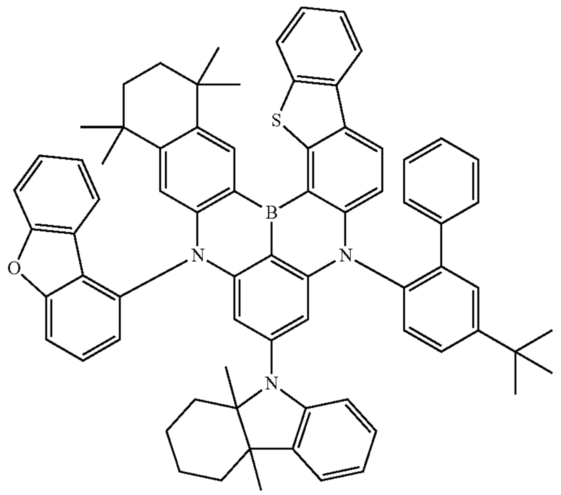
-continued
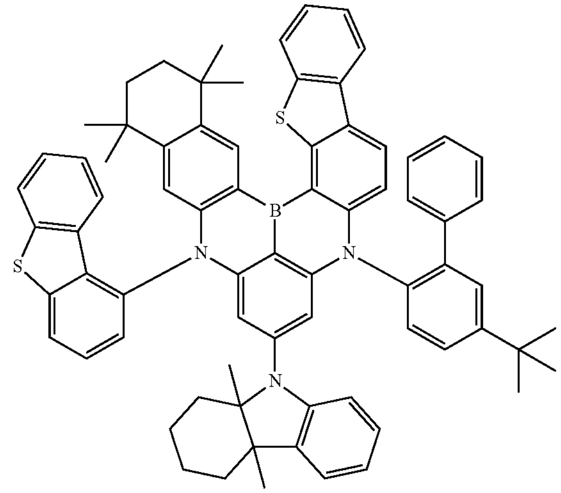
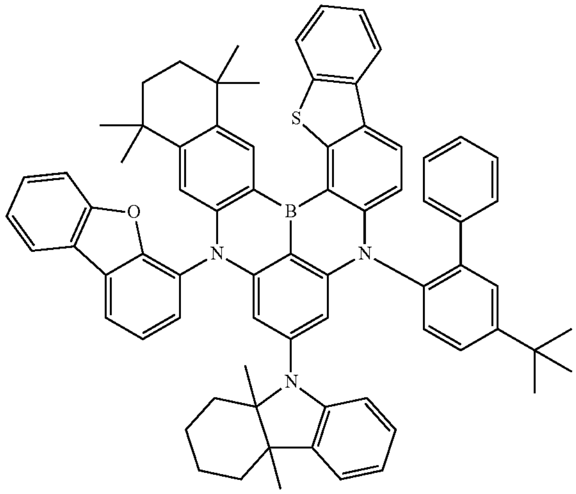
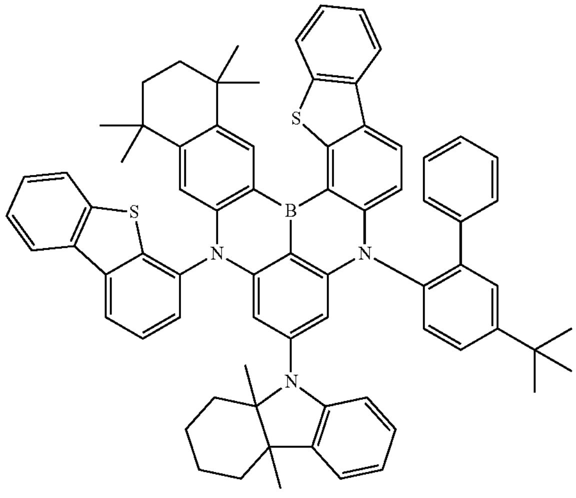

-continued
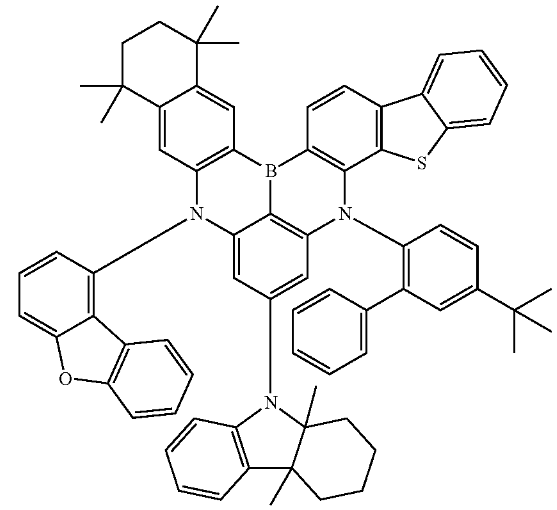
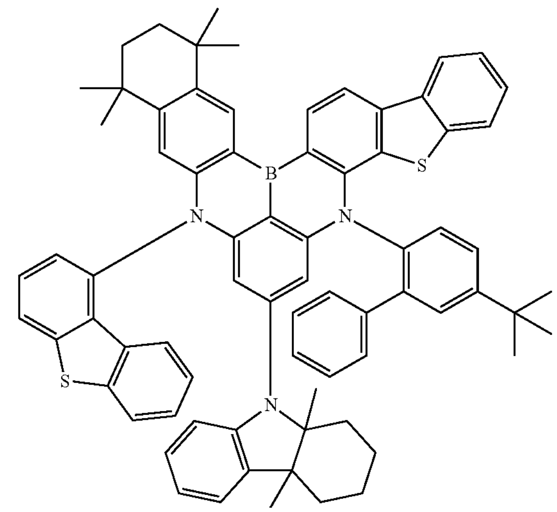
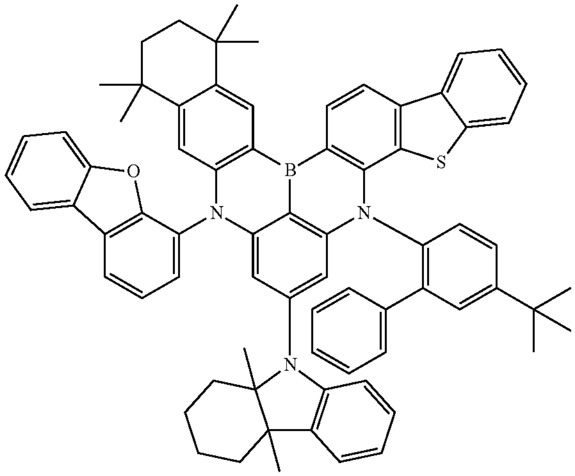
-continued
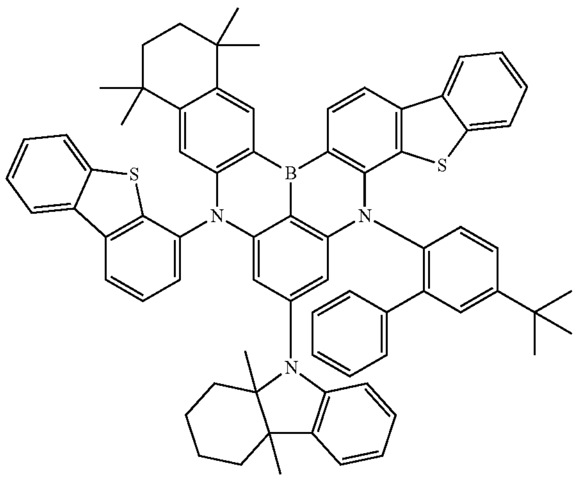
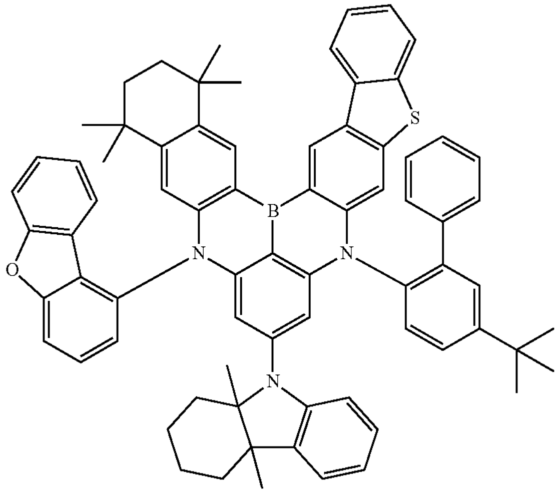
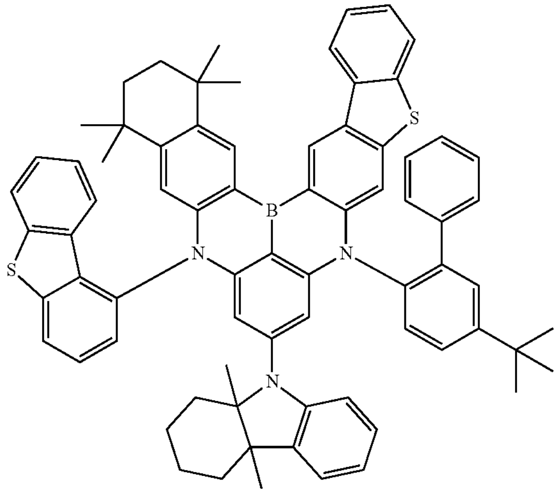

-continued
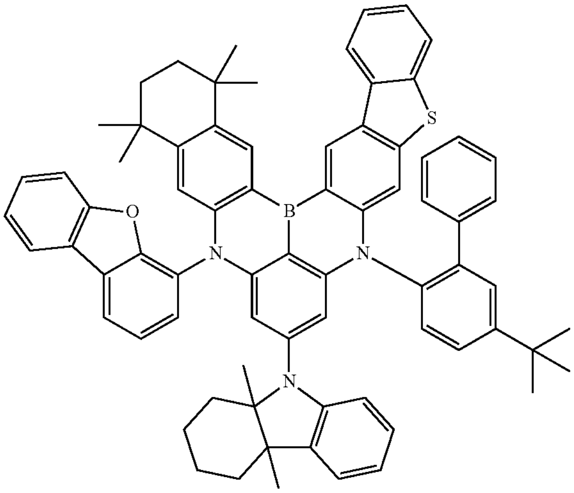
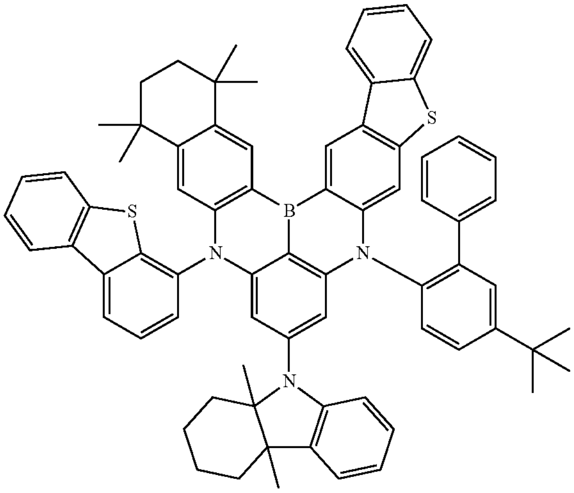
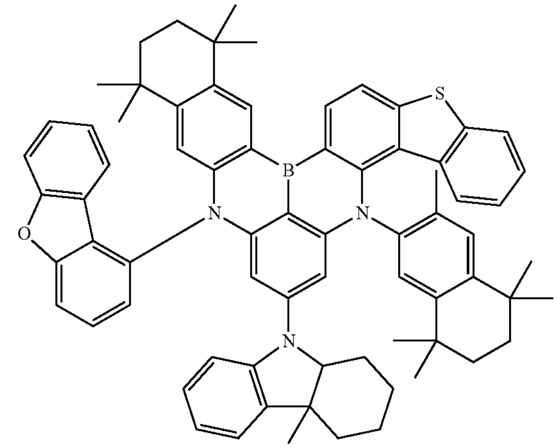
-continued
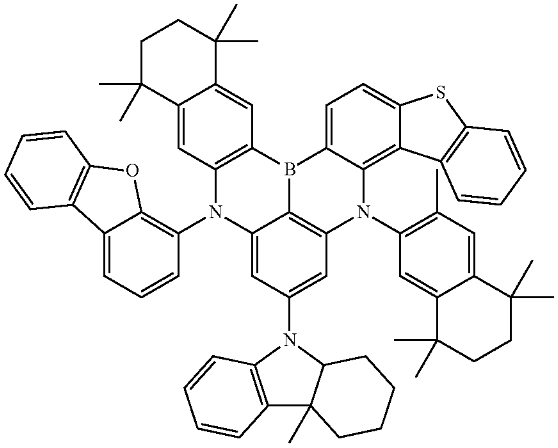
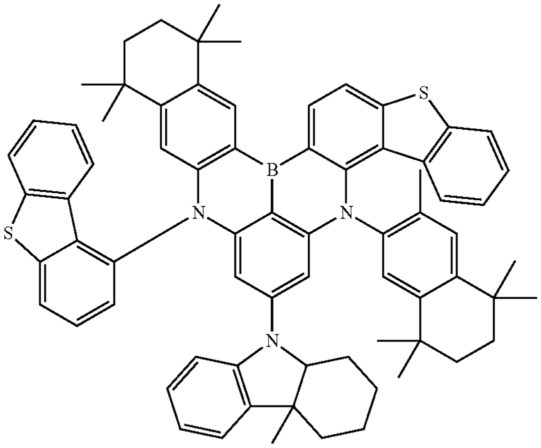
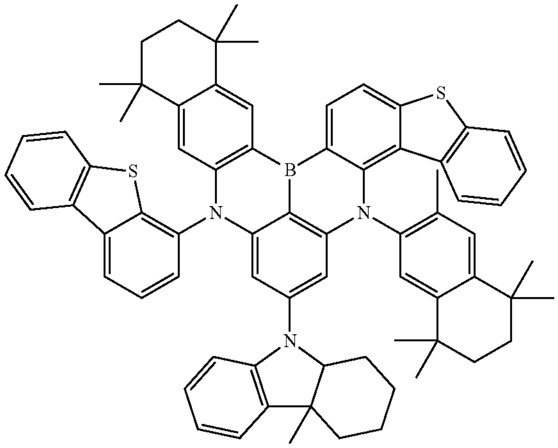

-continued
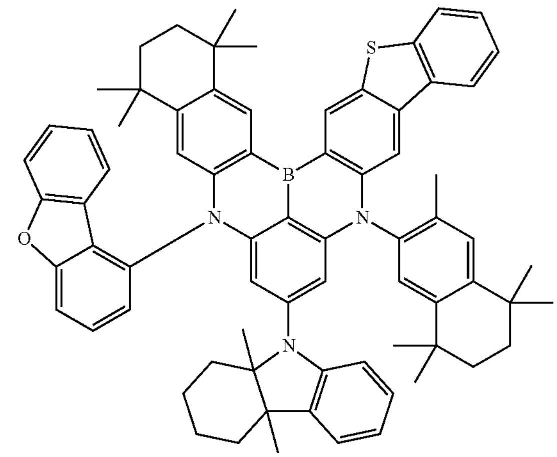
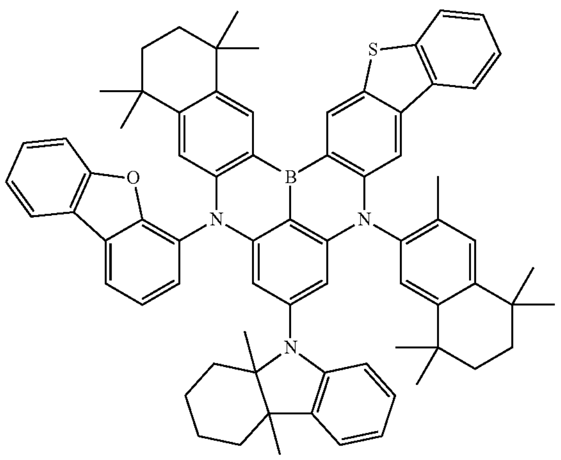
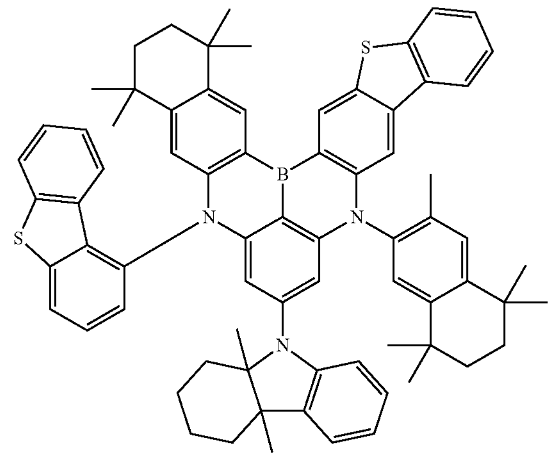
-continued
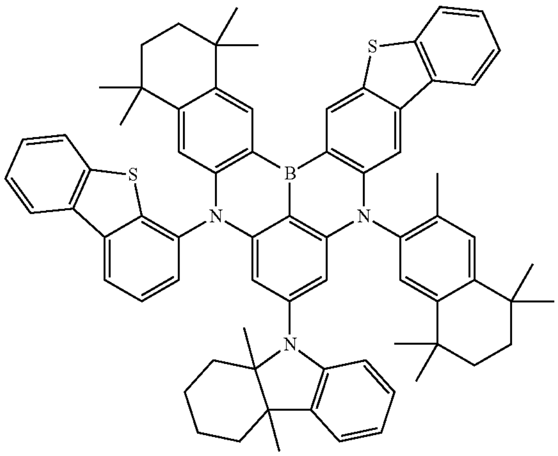
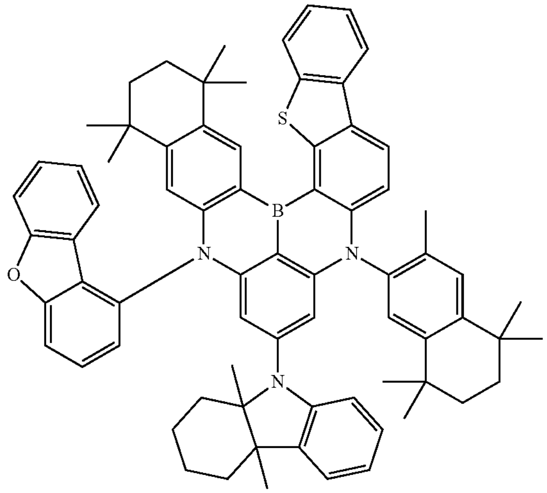
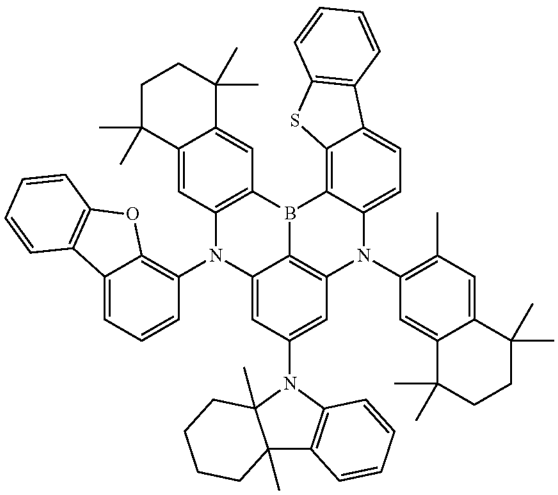

-continued
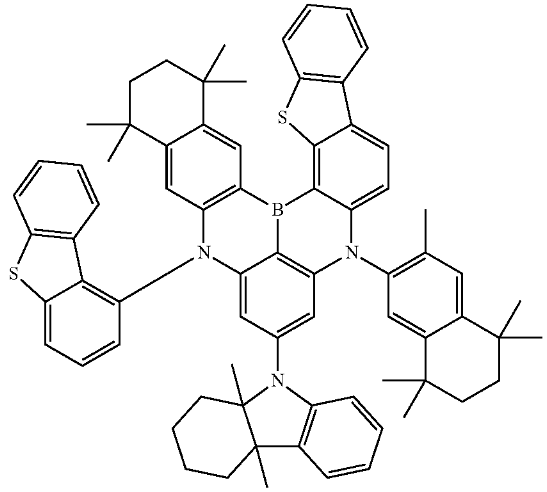
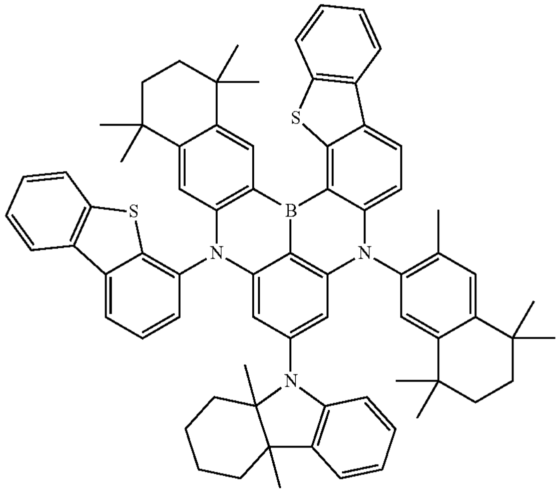
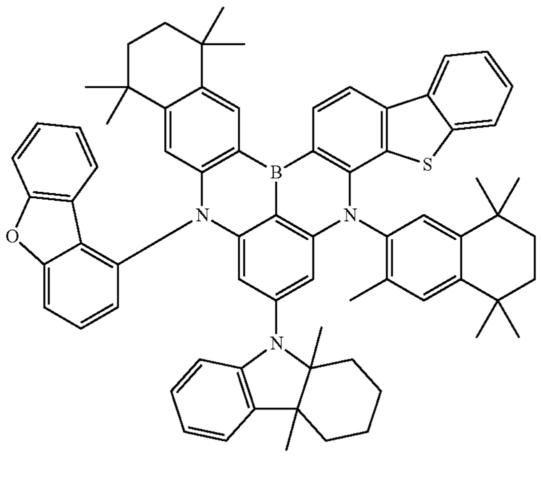
-continued
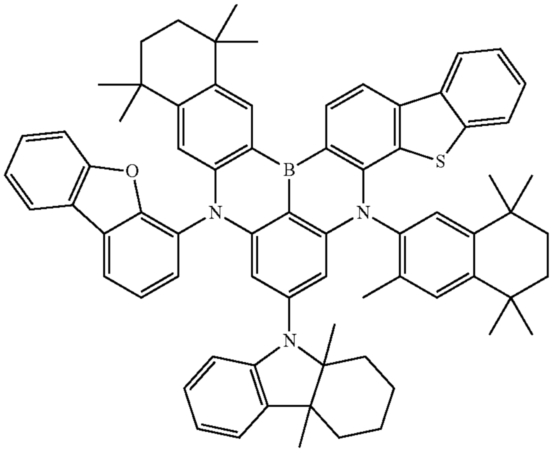
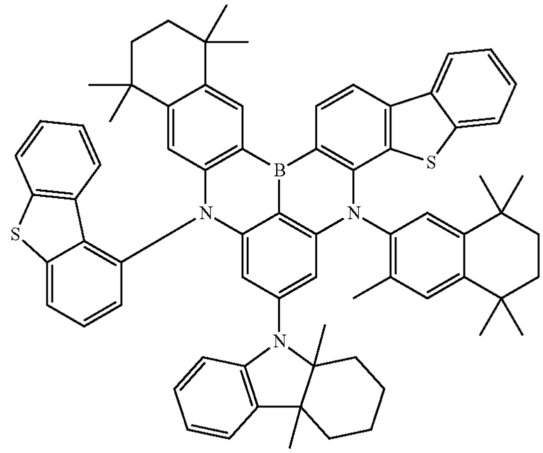
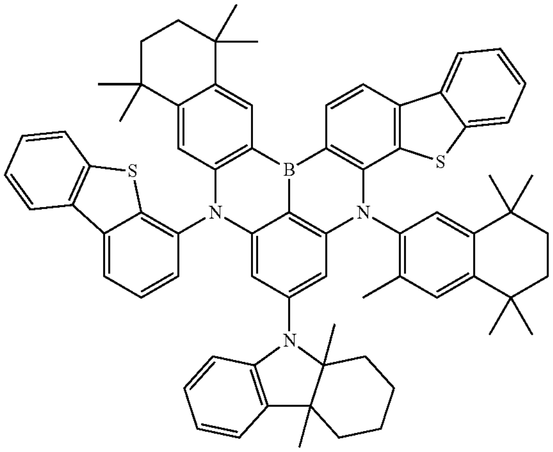

-continued
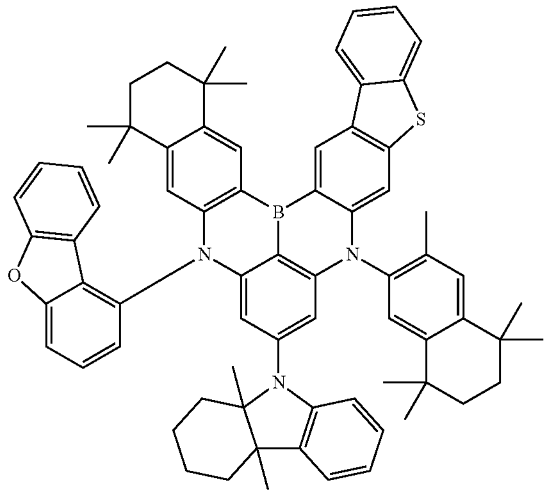
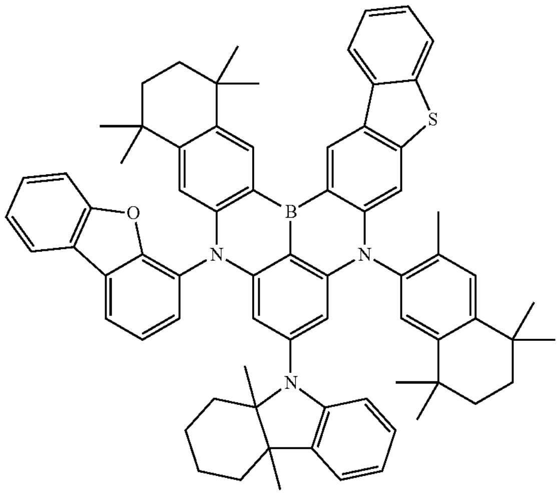
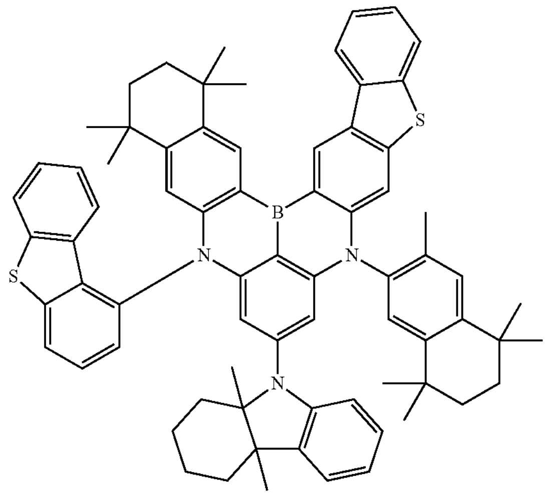
-continued
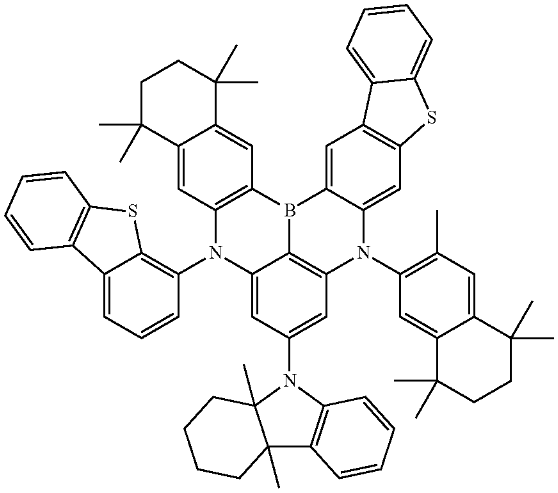
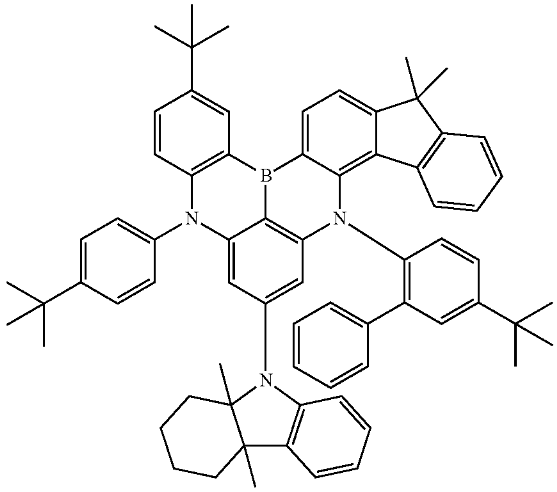
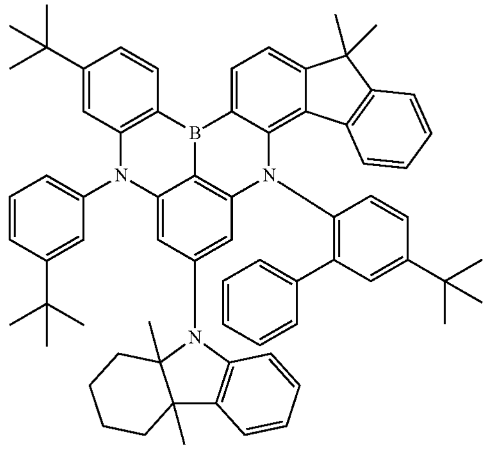

-continued
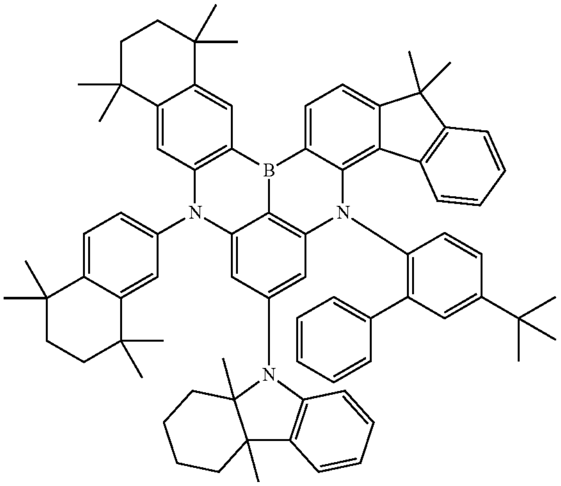
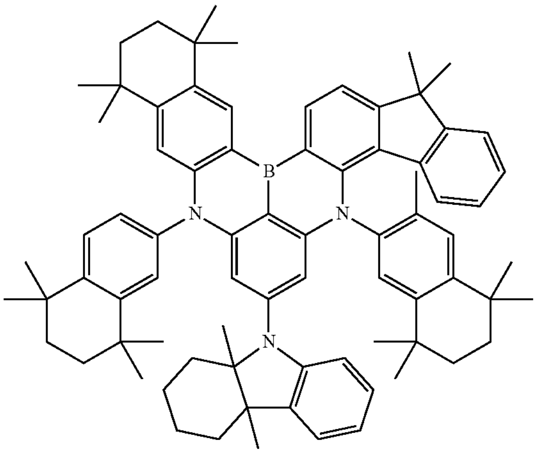
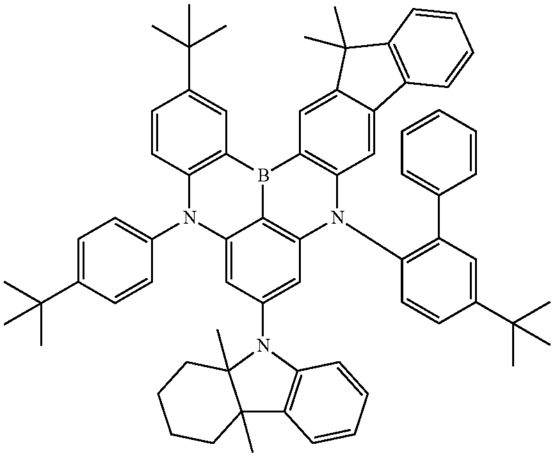
-continued
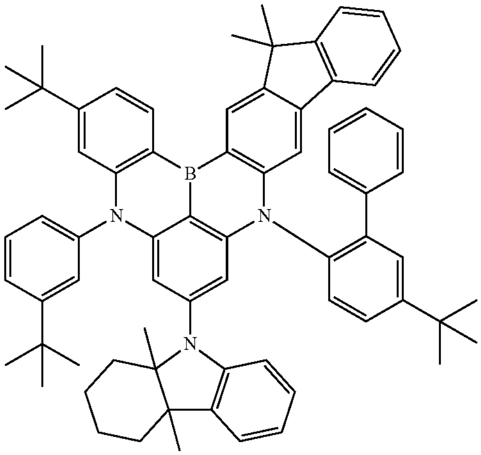 [SMILES: CC(C)(C)c1cccc(N2c3cc(C(C)(C)C)ccc3B3c4cc5c(cc4N(c4ccc(C(C)(C)C)cc4-c4ccccc4)c4cc(N6c7ccccc7C7(C)CCCCC67C)cc2c43)-c2ccccc2C5(C)C)c1]
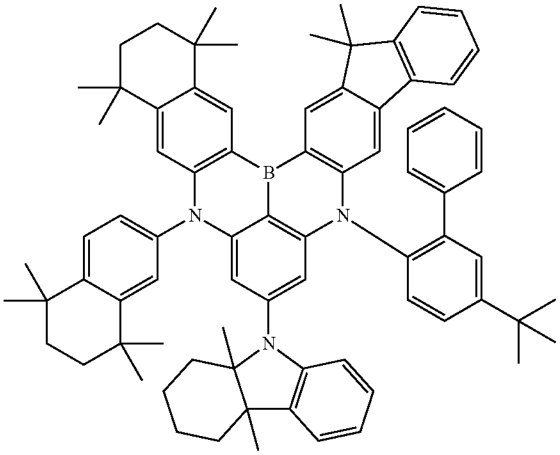
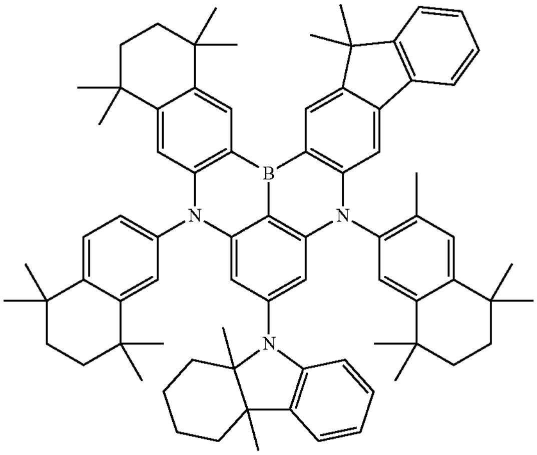

-continued
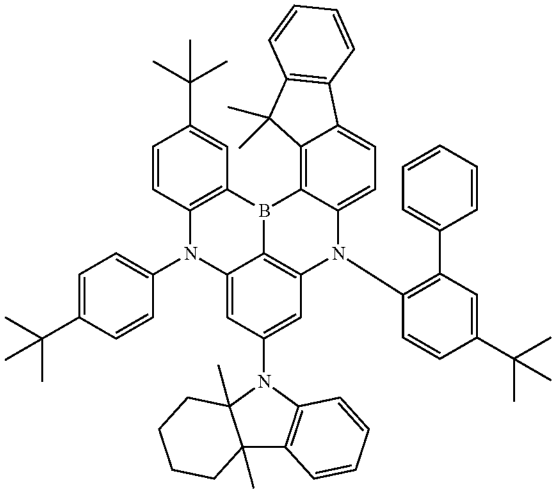
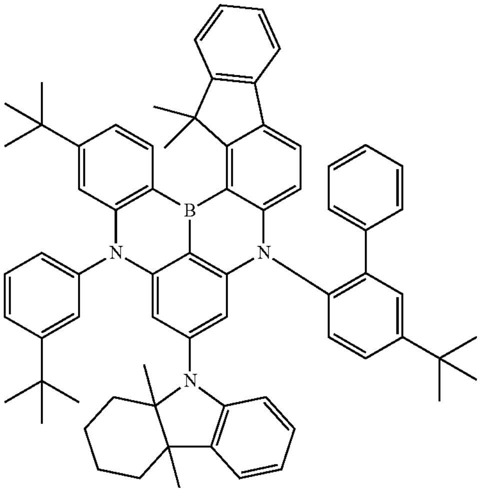
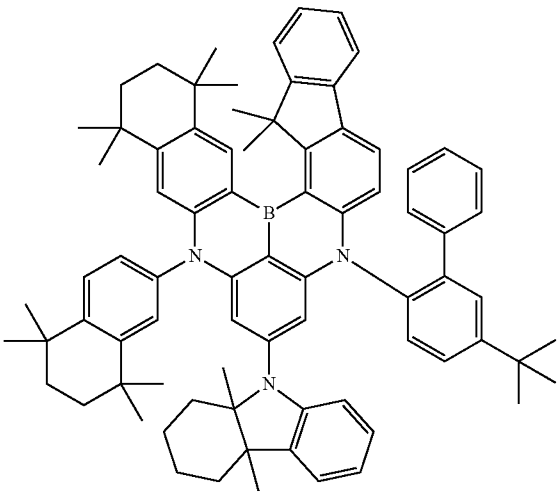
-continued
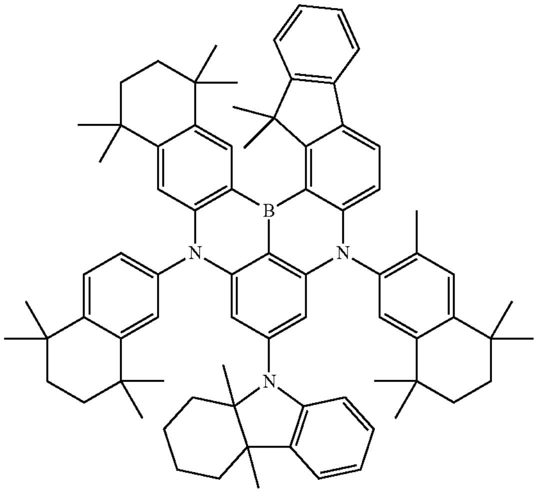
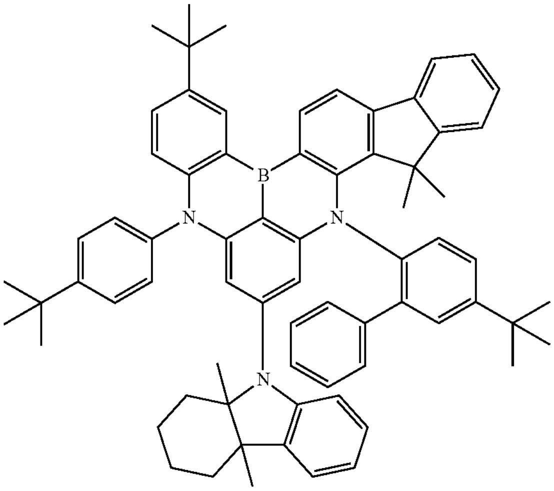
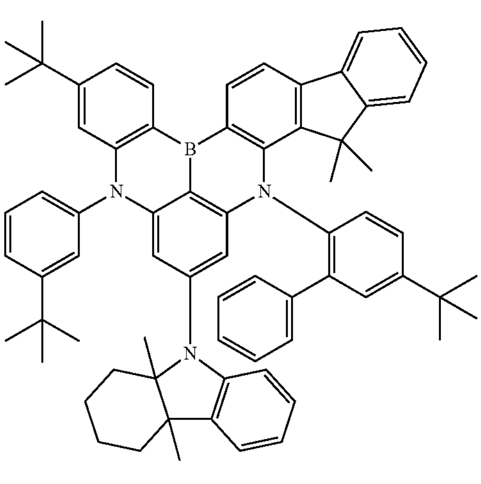

-continued
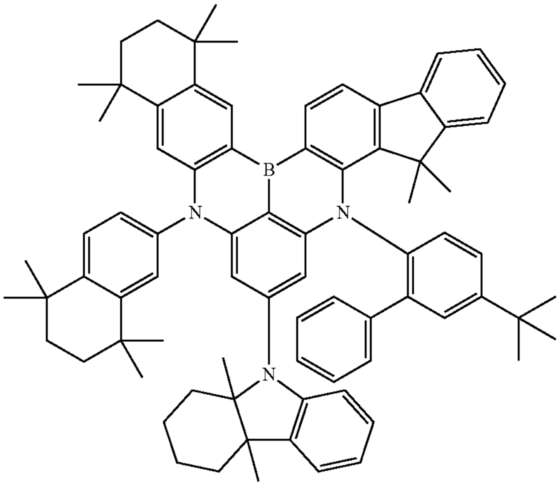
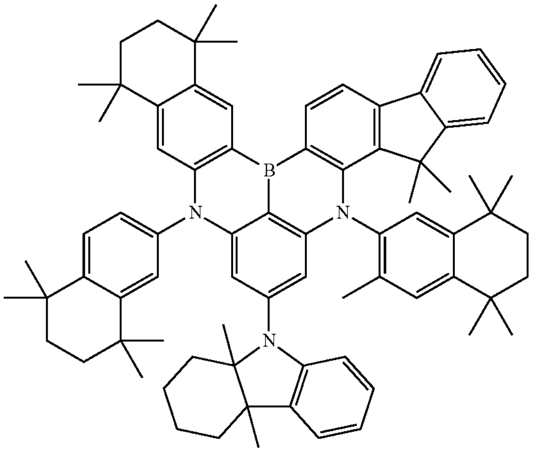
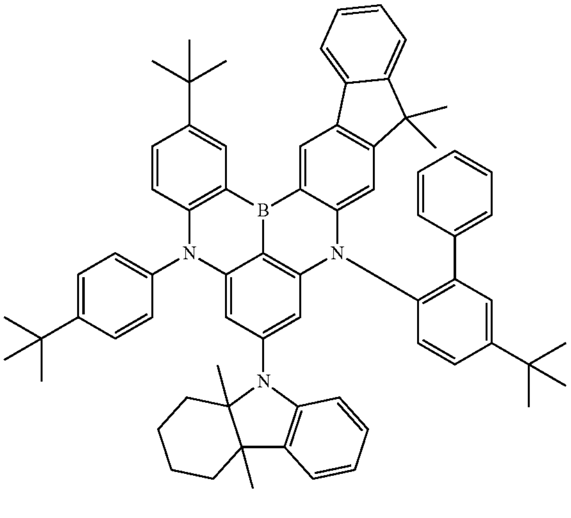
-continued
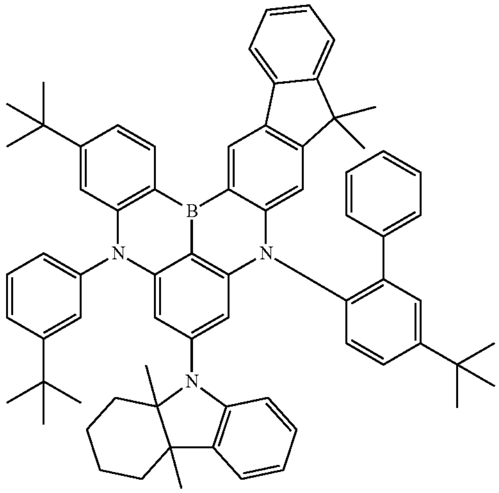
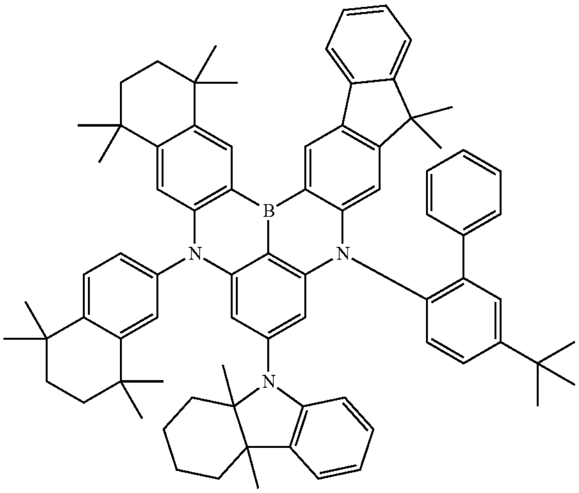
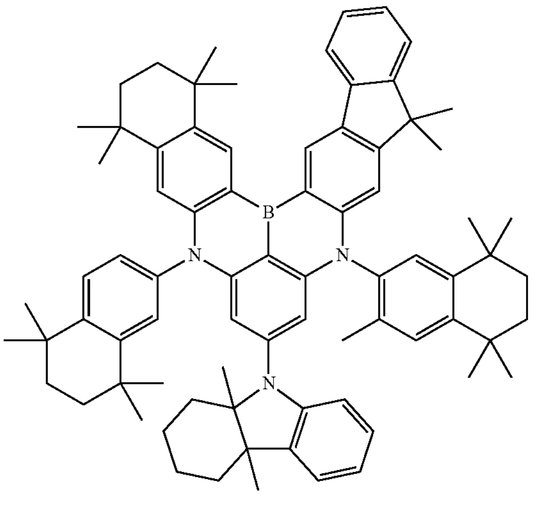

-continued
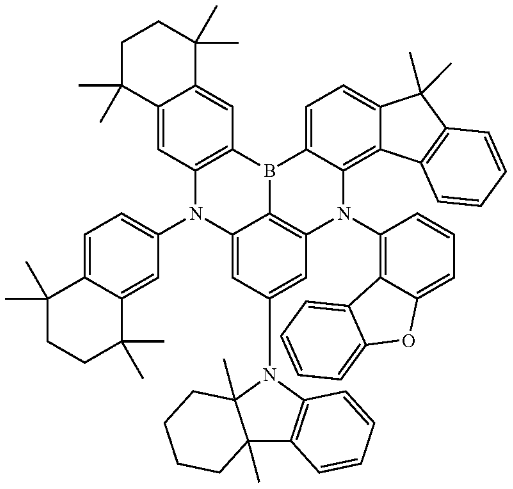
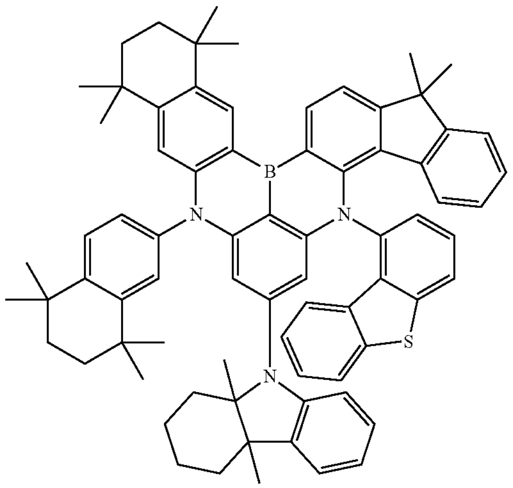
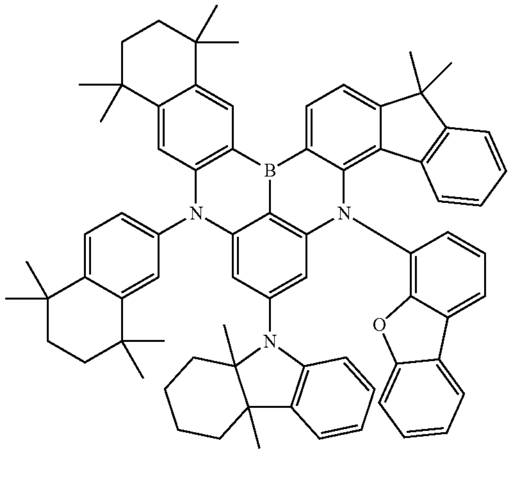
-continued
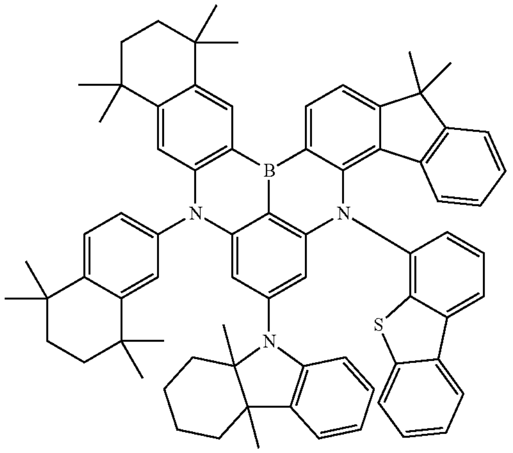
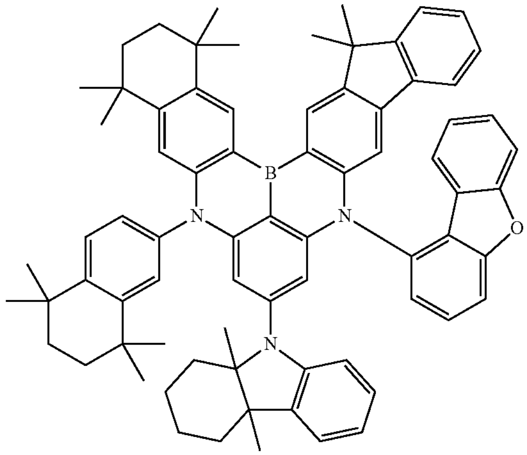
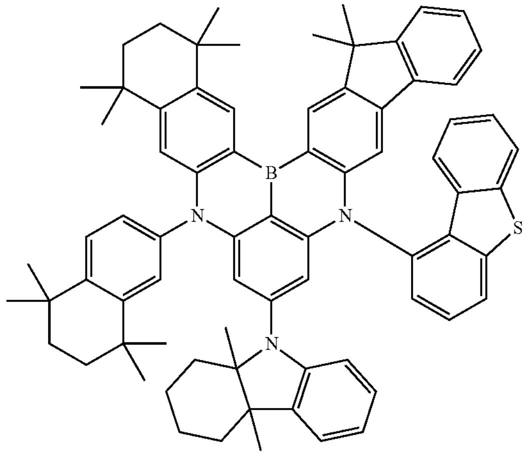

-continued
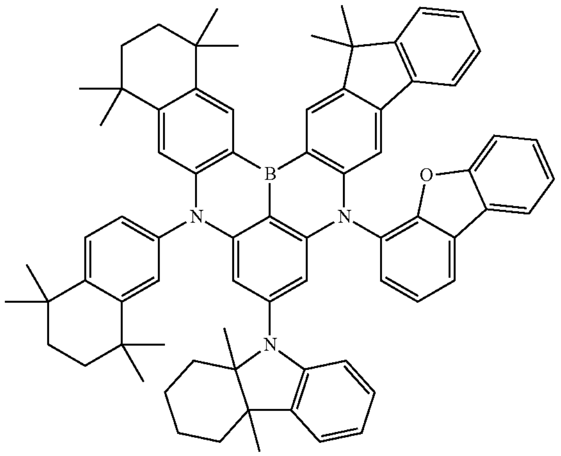
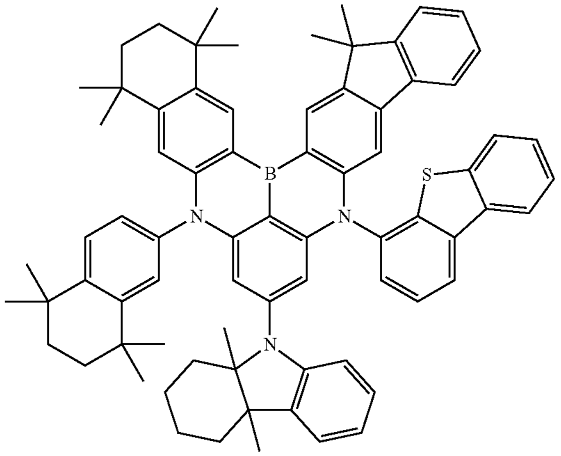
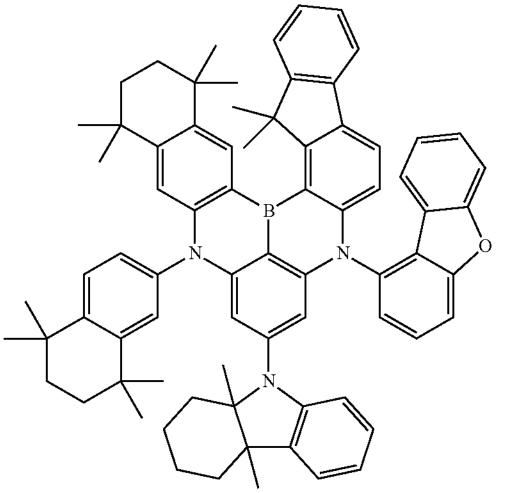
-continued
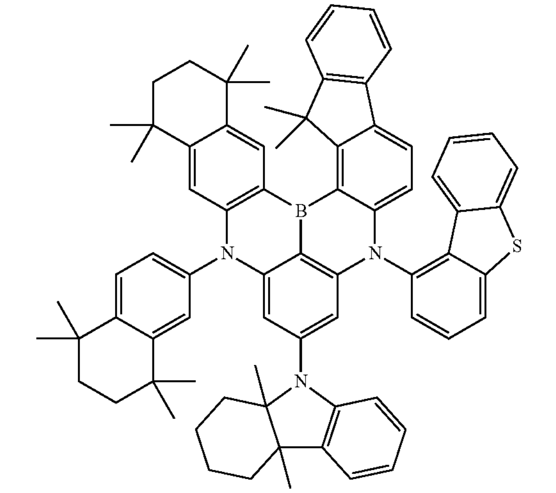
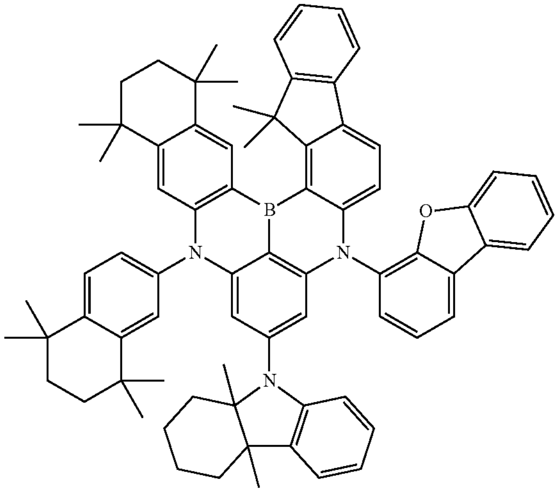
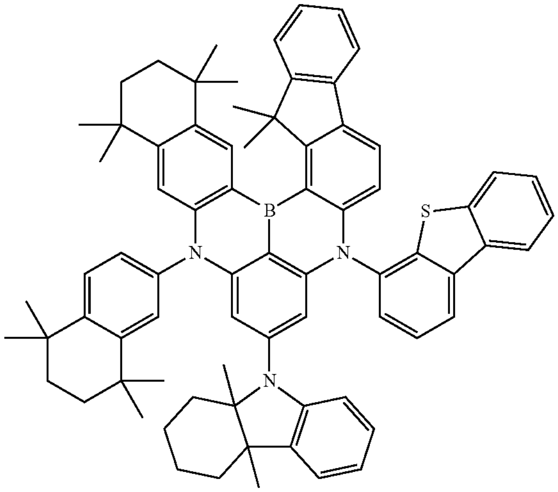

-continued
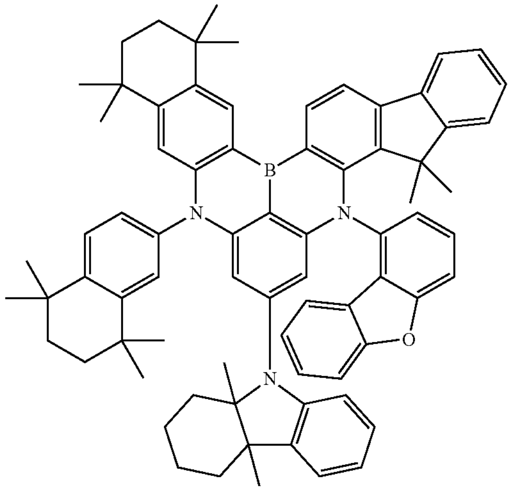
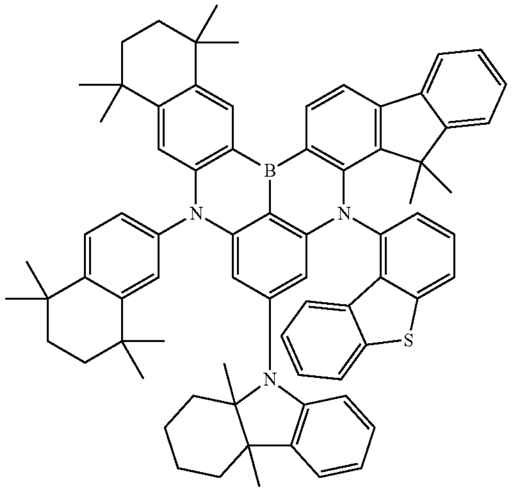
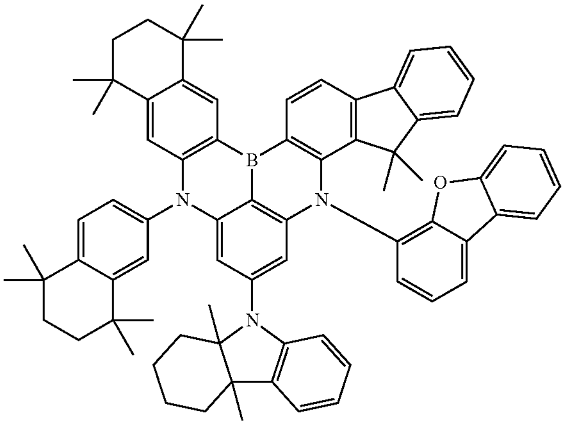
-continued
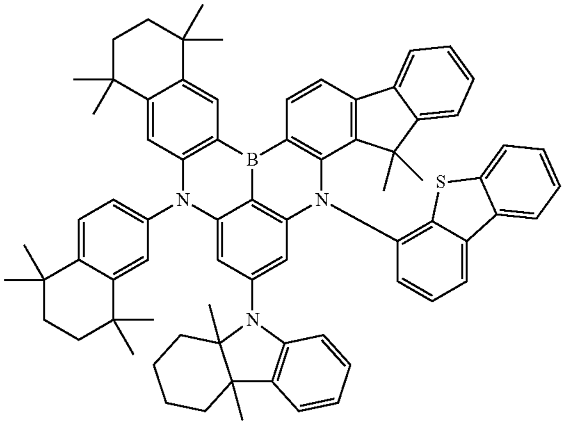
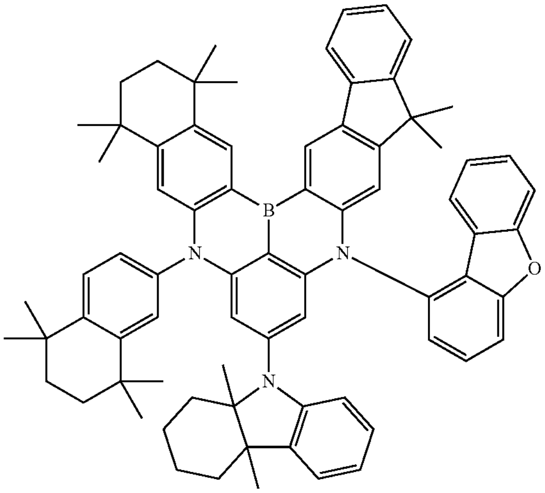
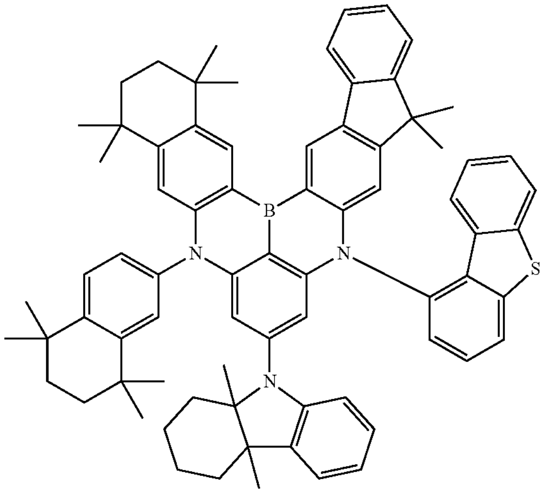

-continued
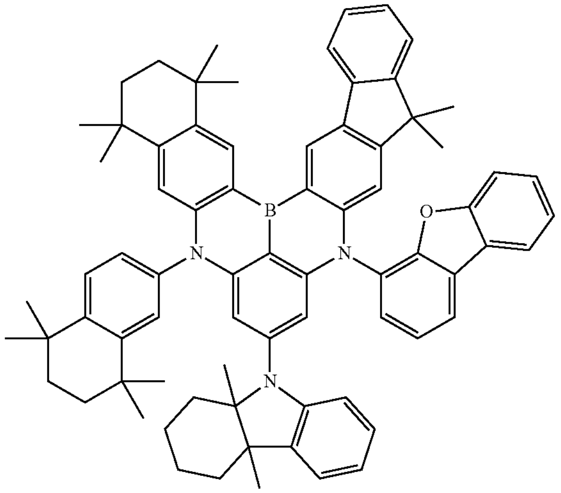
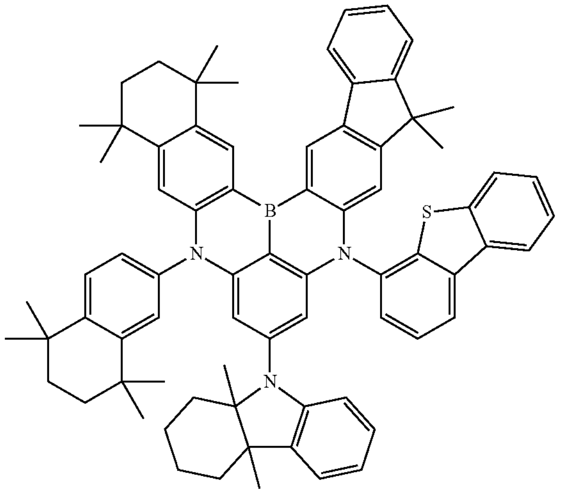
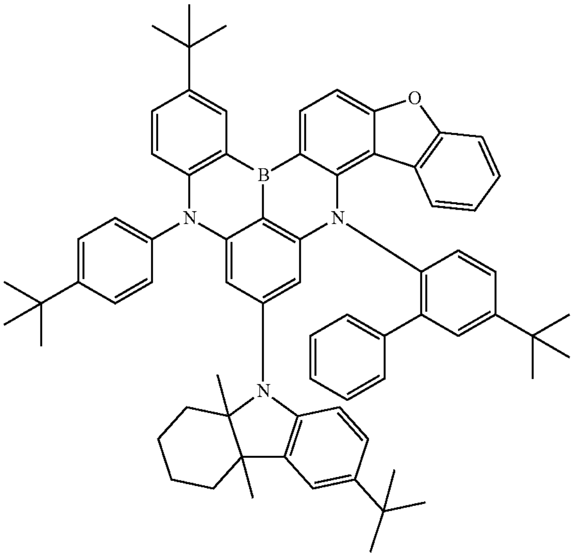
-continued
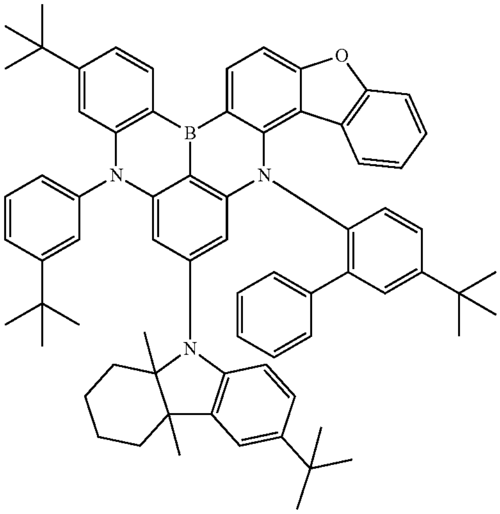
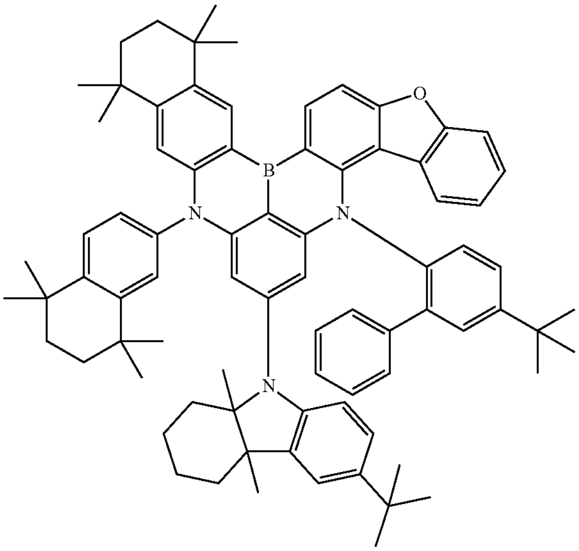
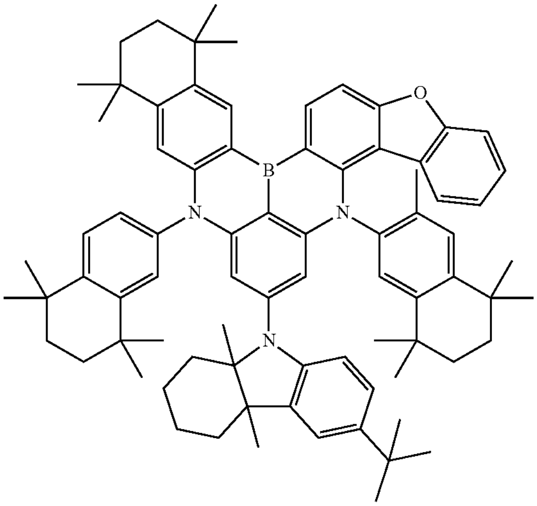

-continued
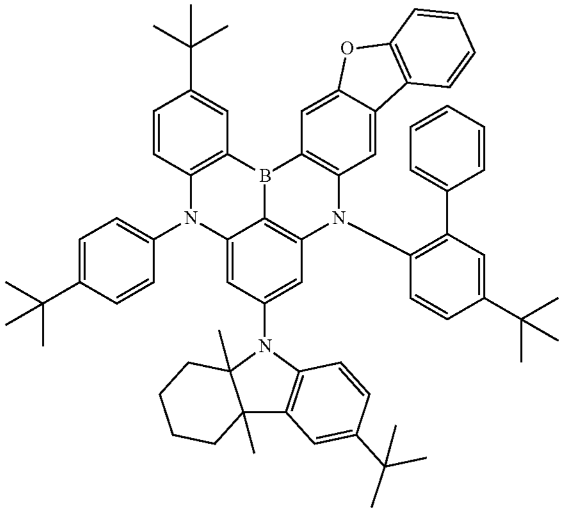
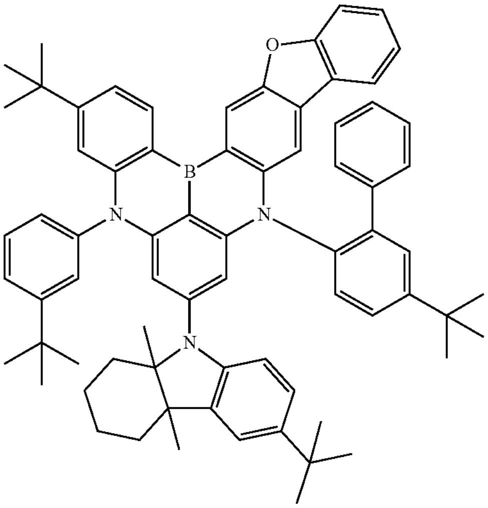
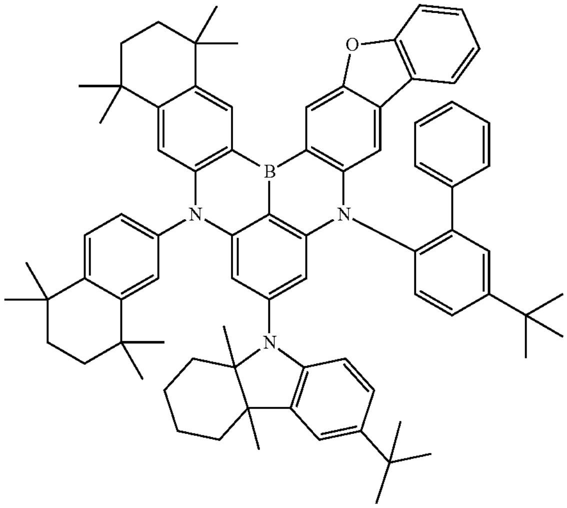
-continued
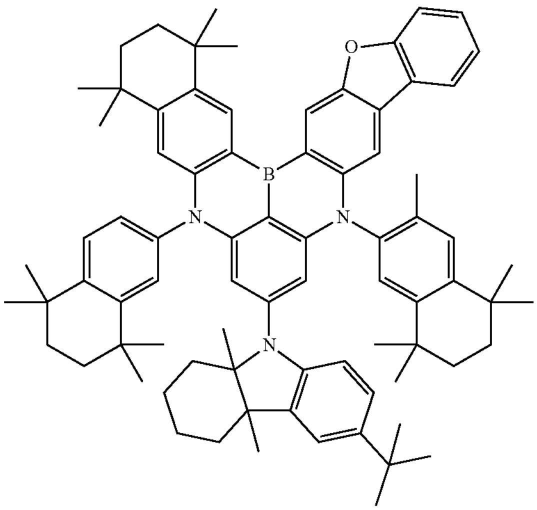
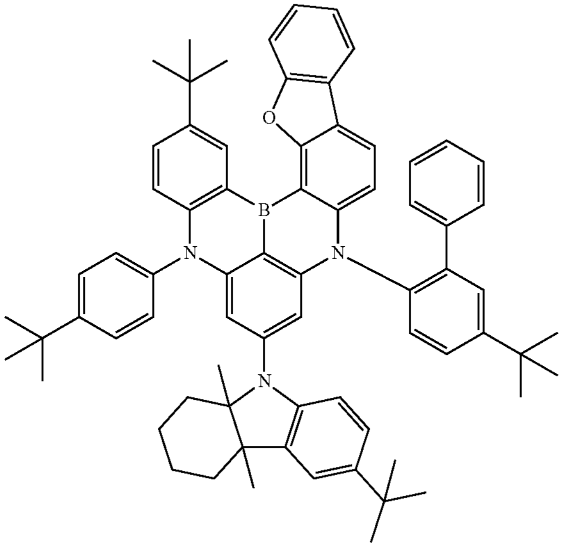
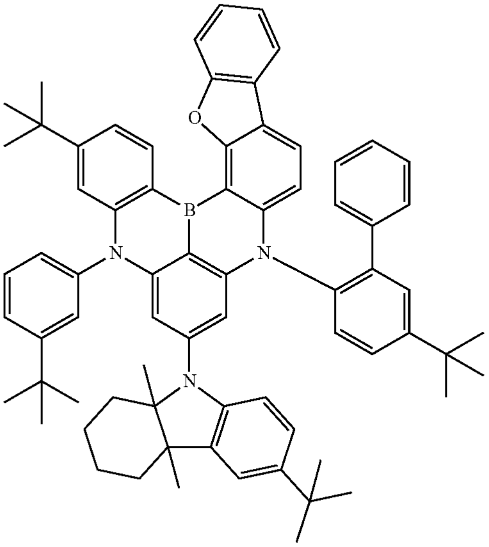

-continued
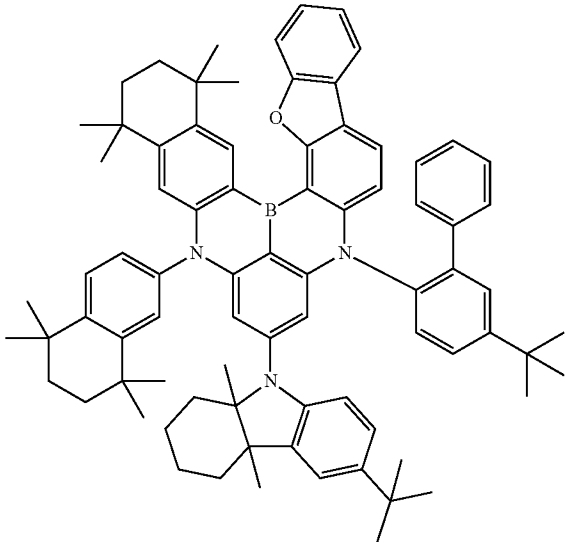
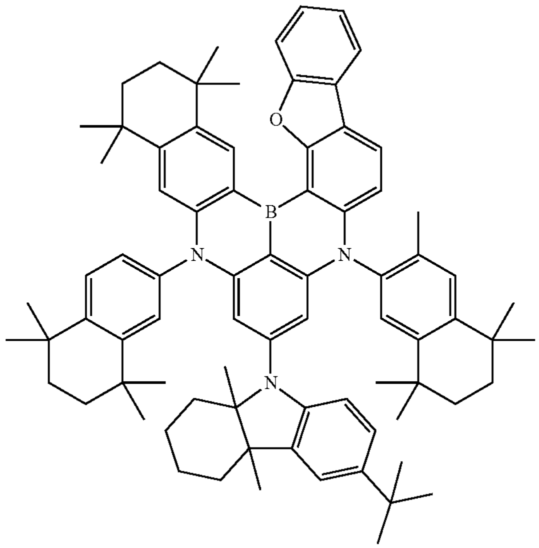
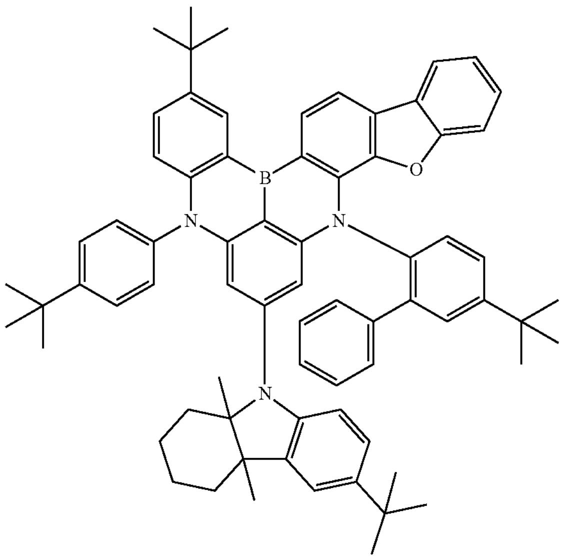
-continued
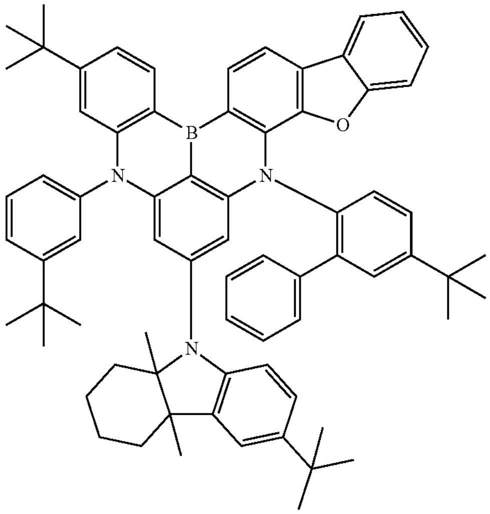
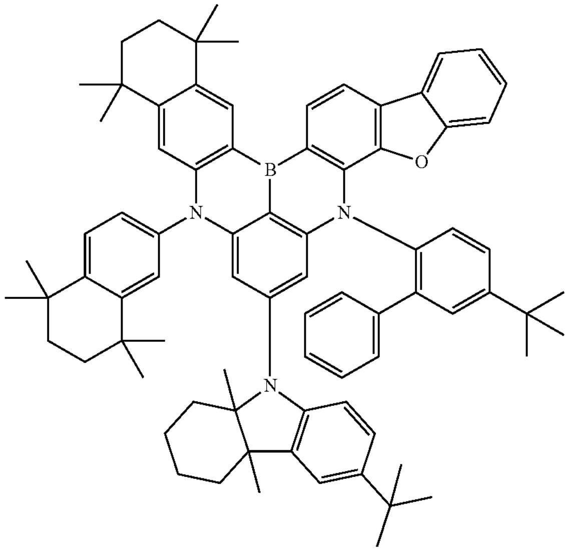
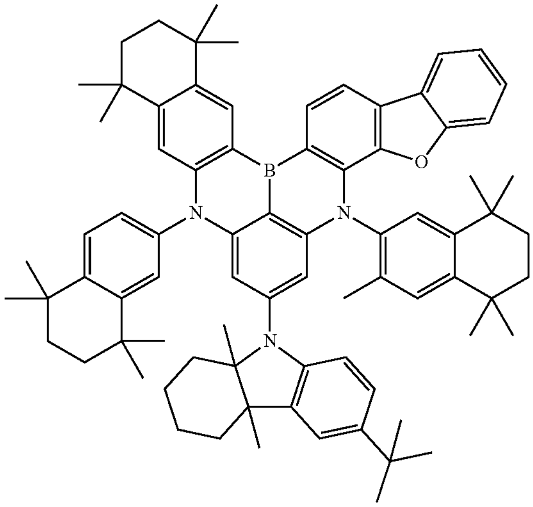

-continued
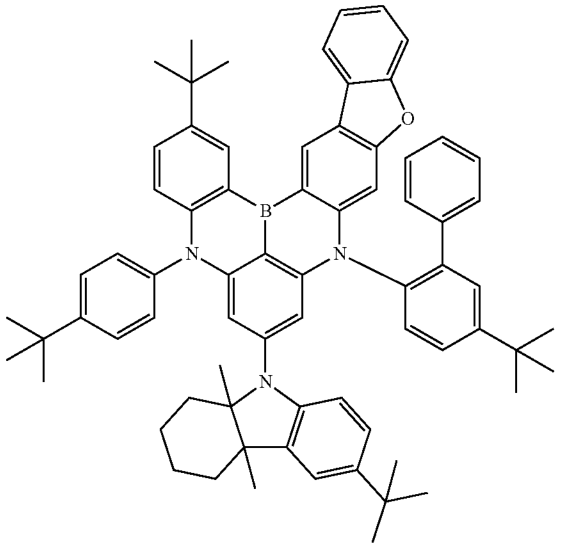
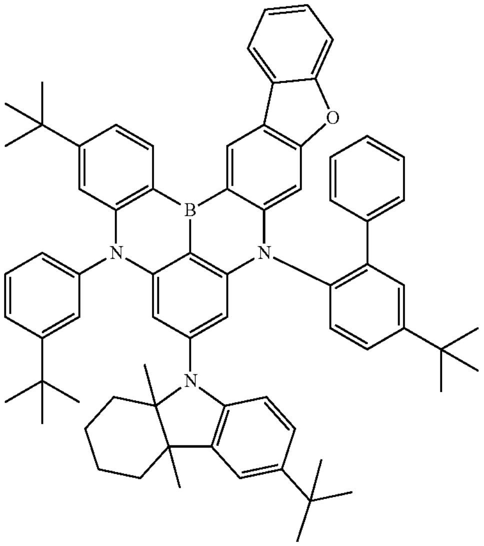
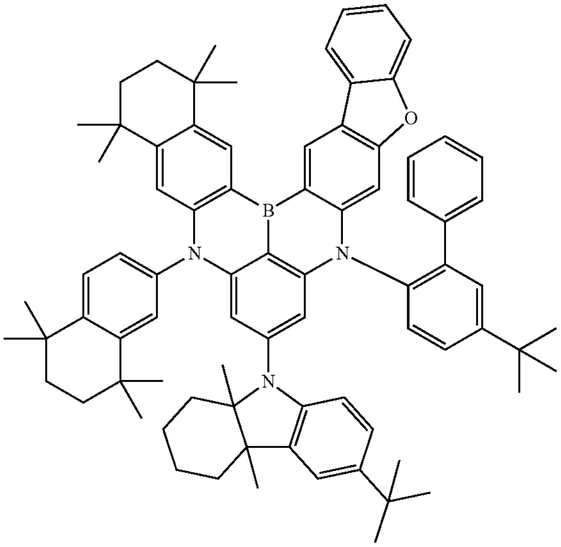
-continued
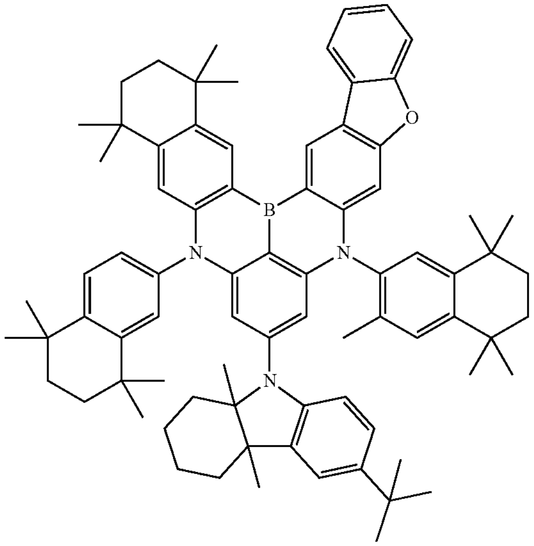
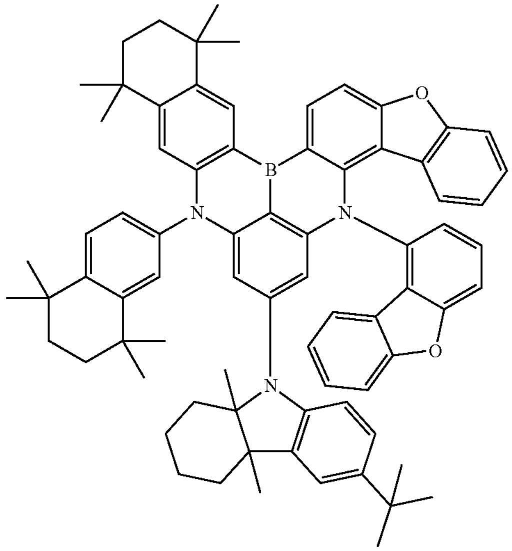
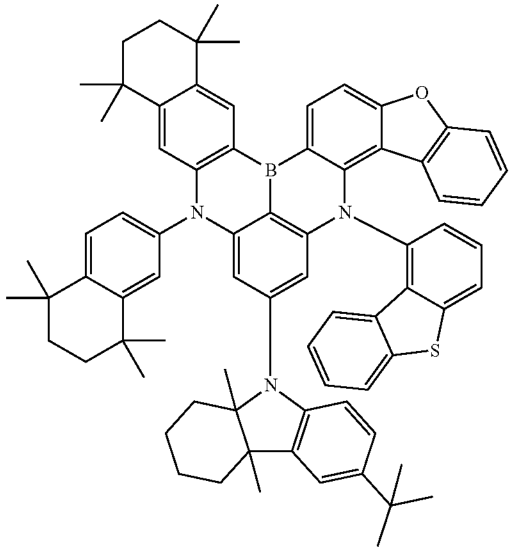

-continued
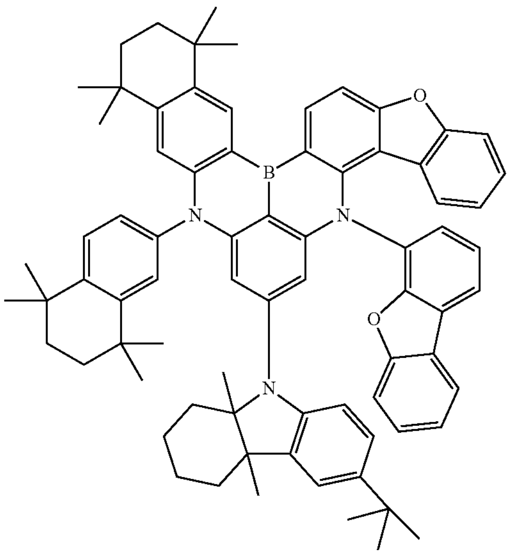
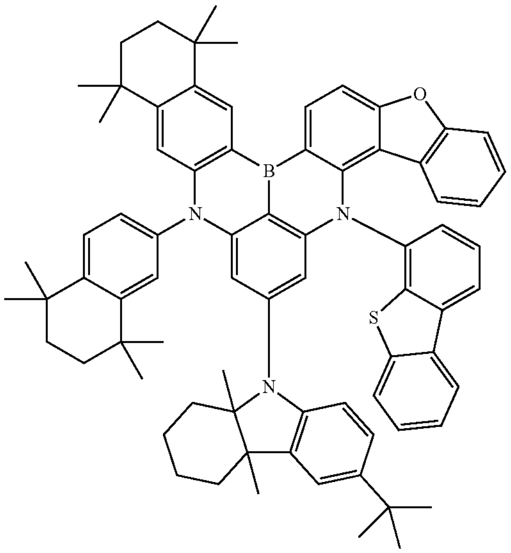
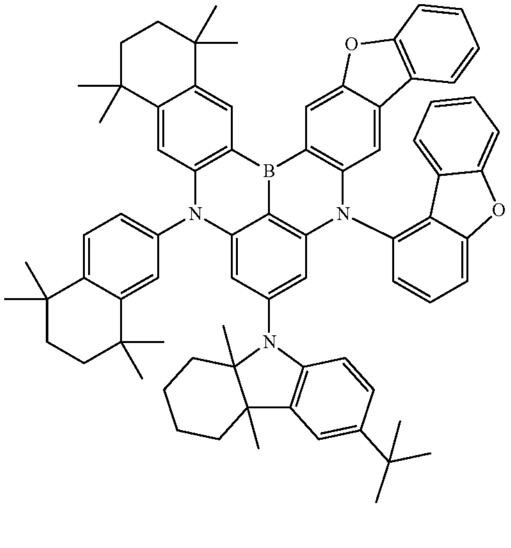
-continued
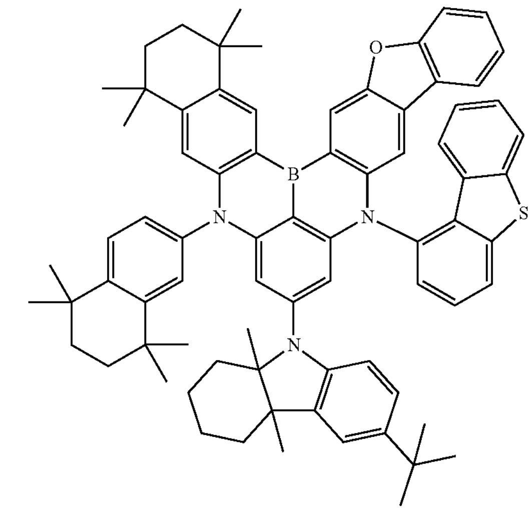
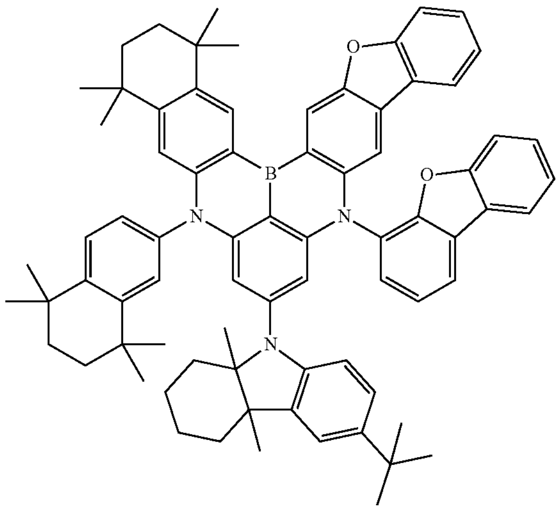
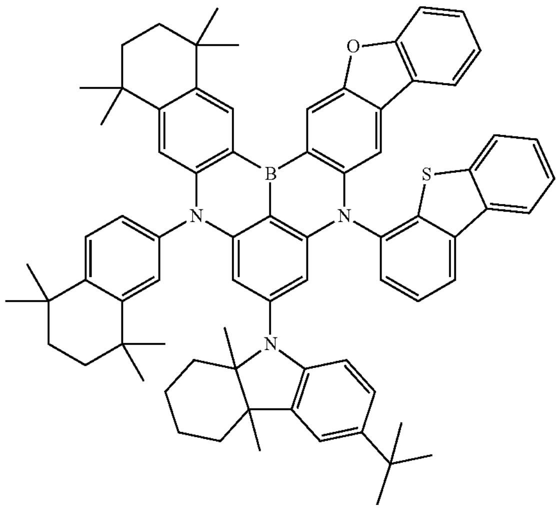

-continued
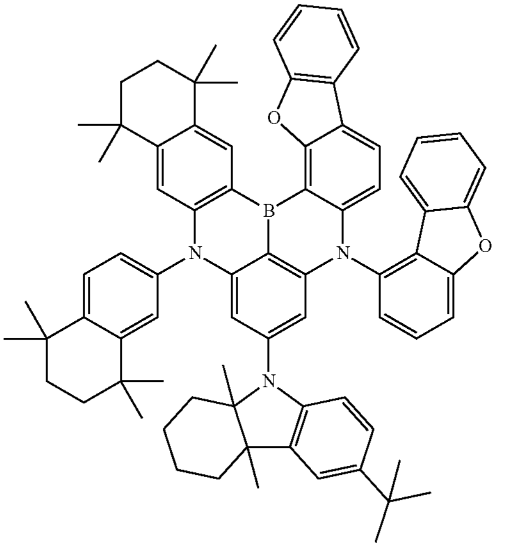
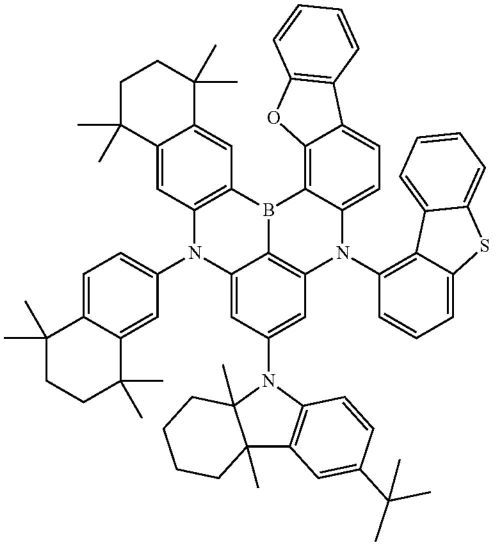
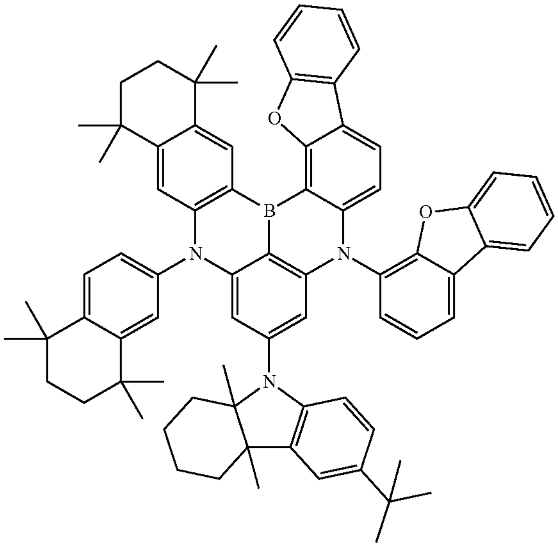
-continued
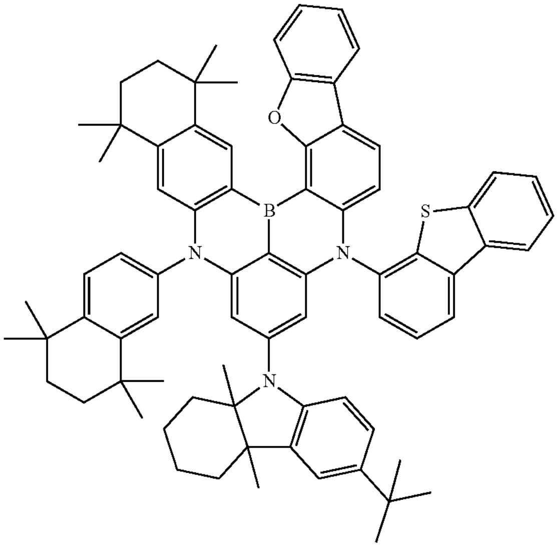
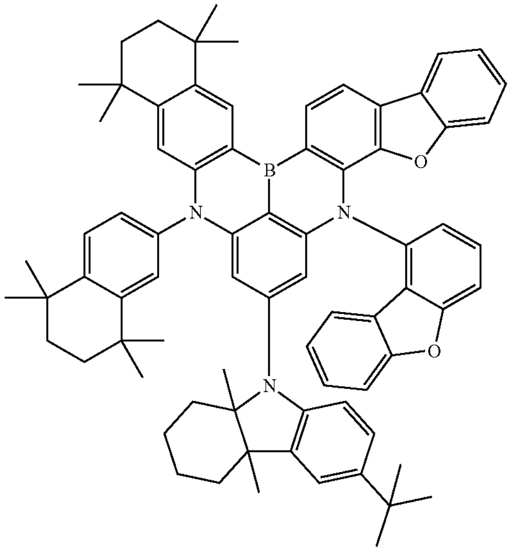
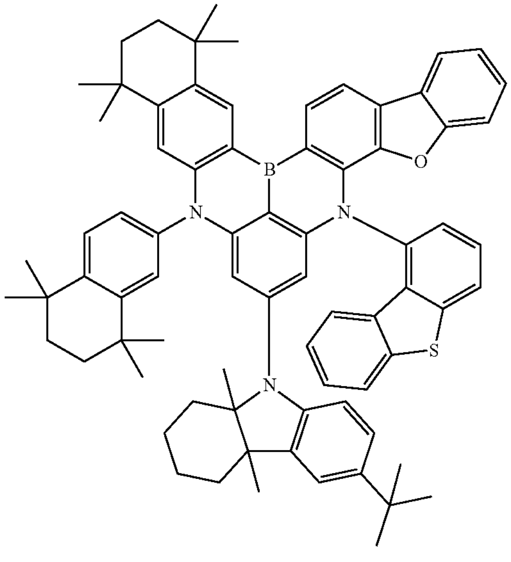

-continued
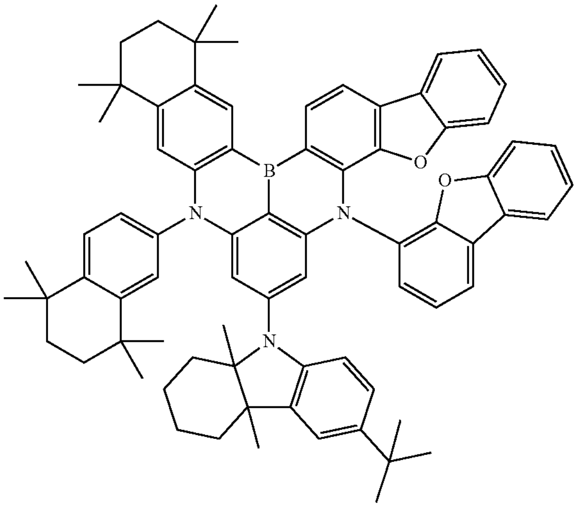
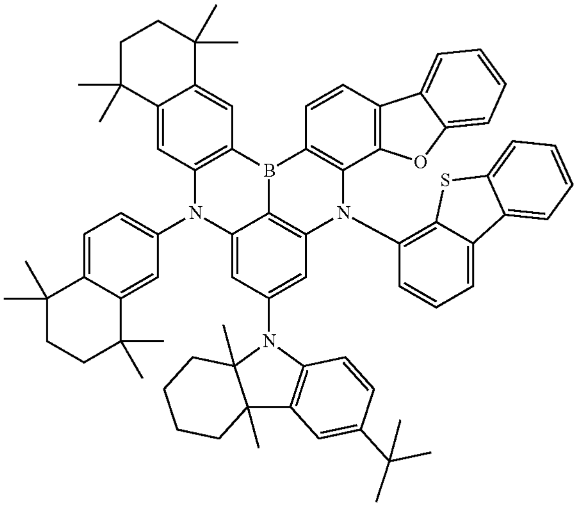
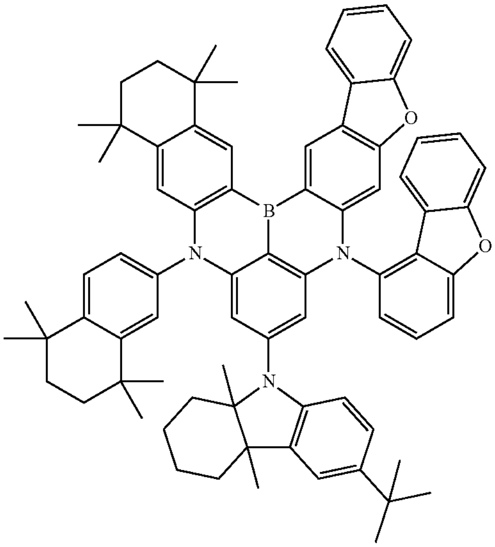
-continued
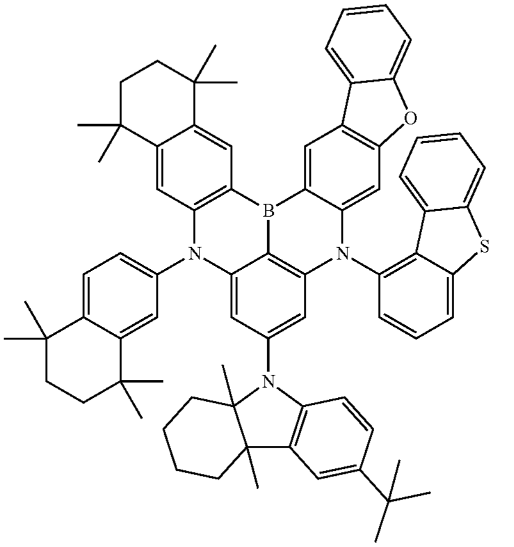
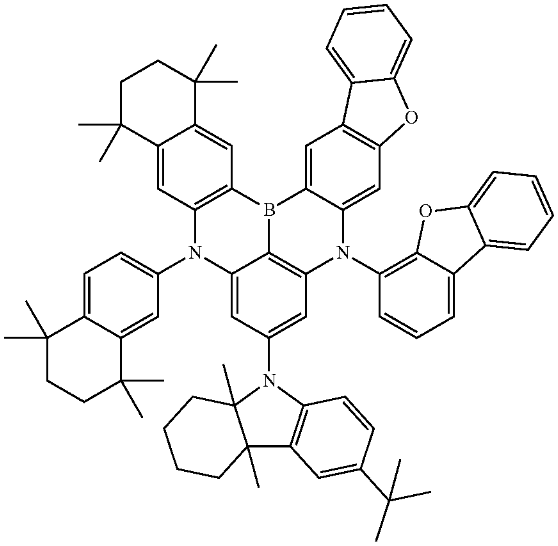
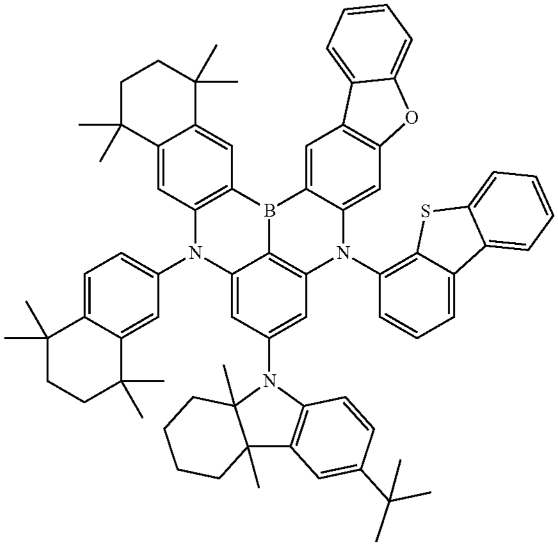

-continued
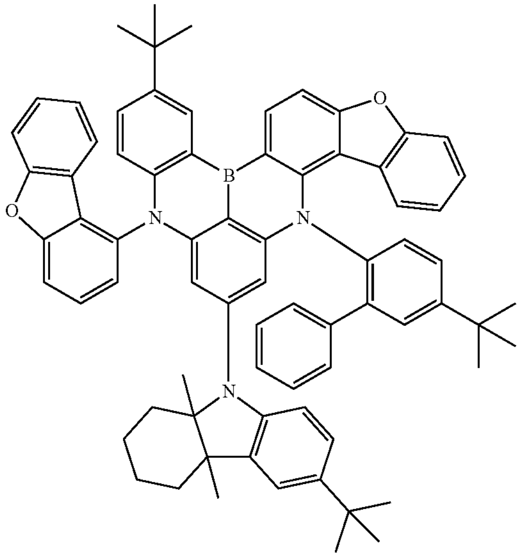
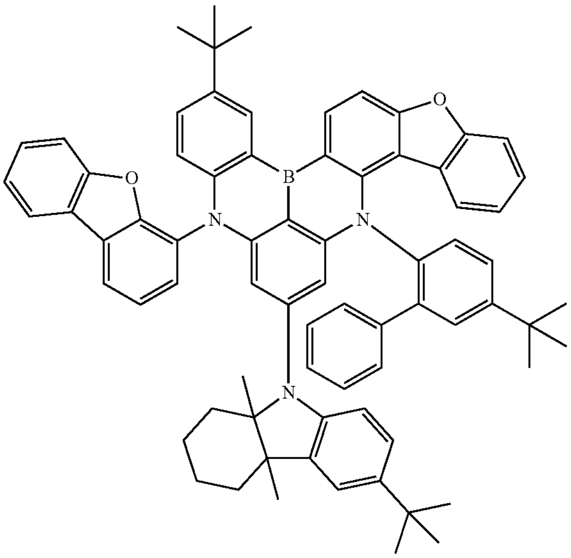
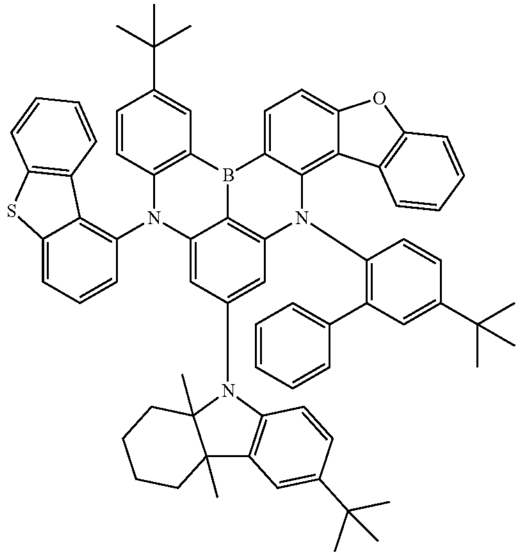
-continued
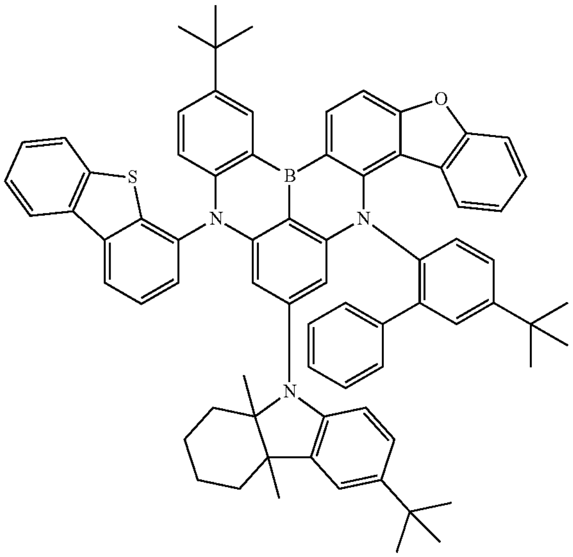
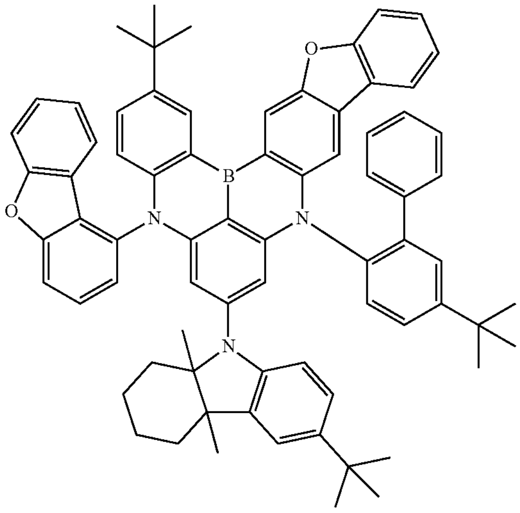
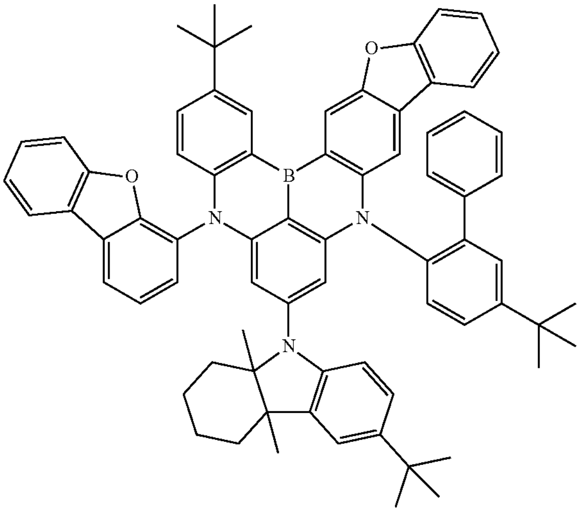

-continued
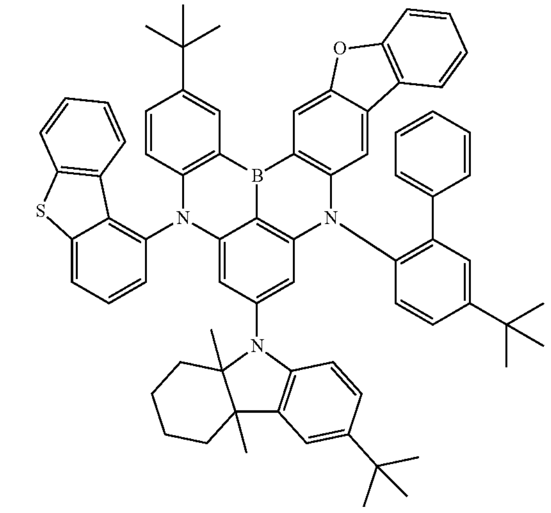
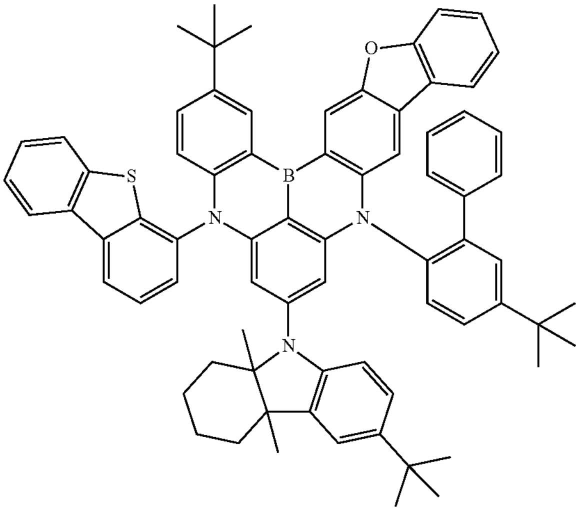
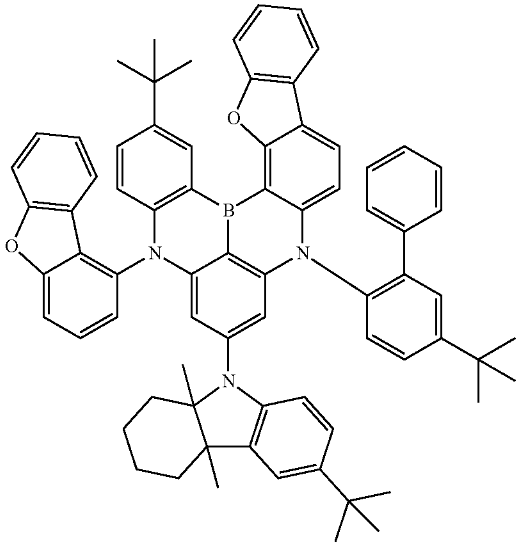
-continued
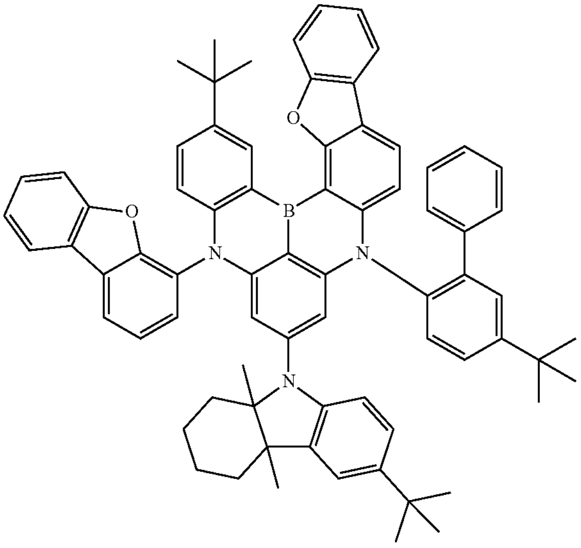
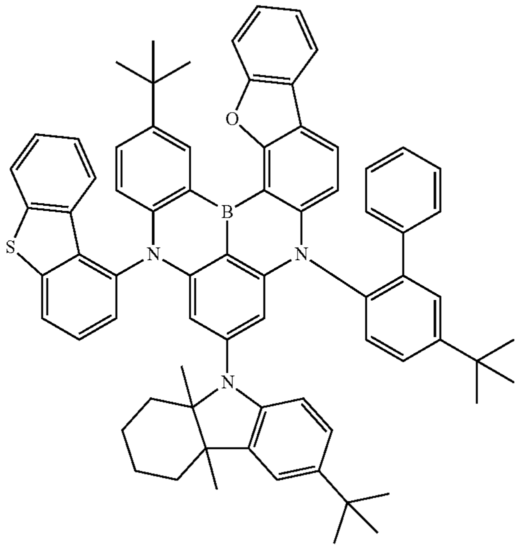
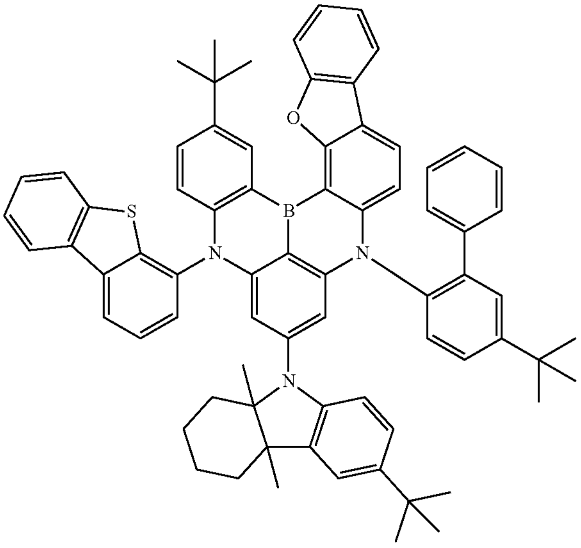

-continued
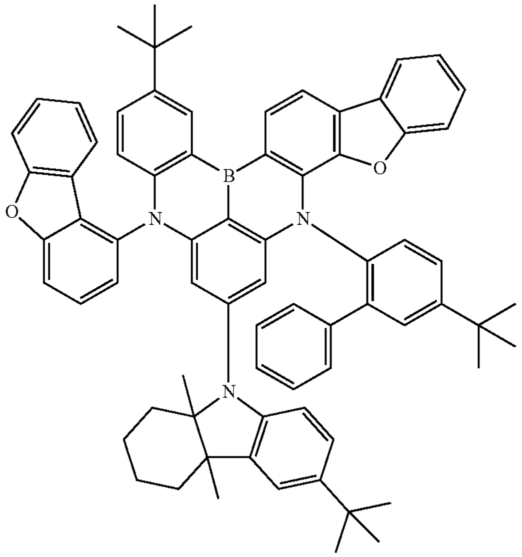
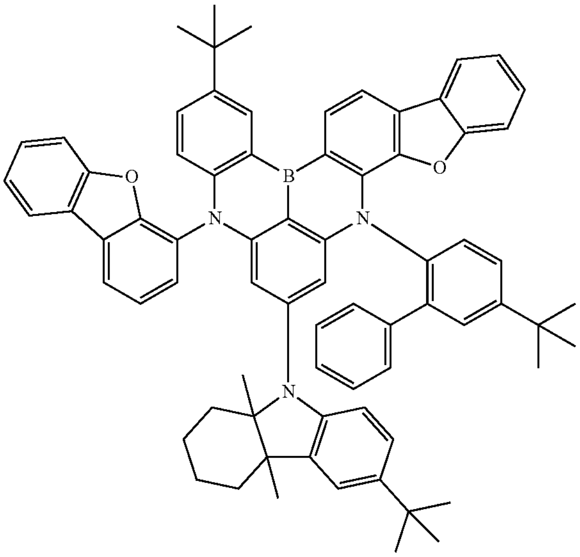
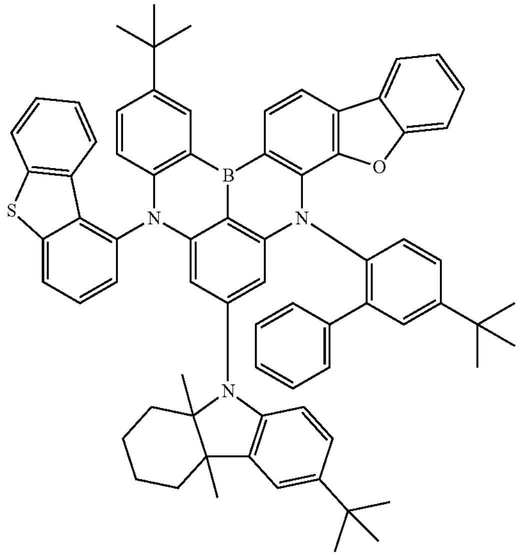
-continued
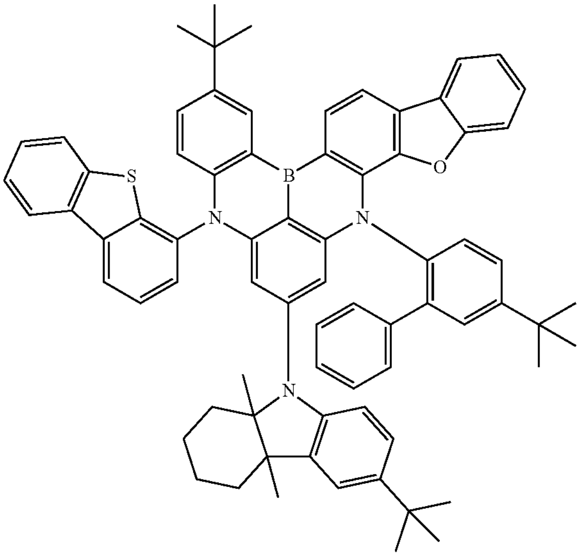
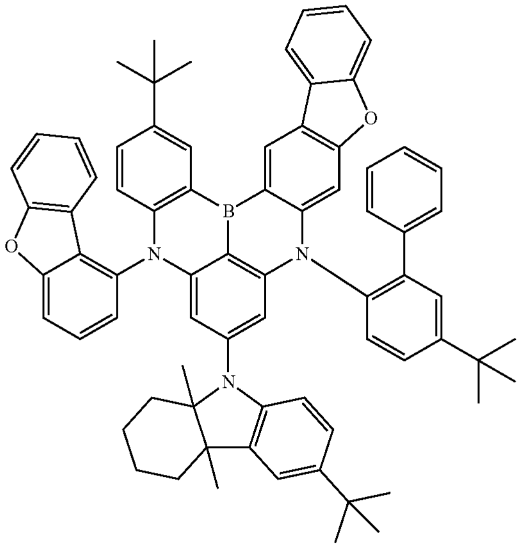
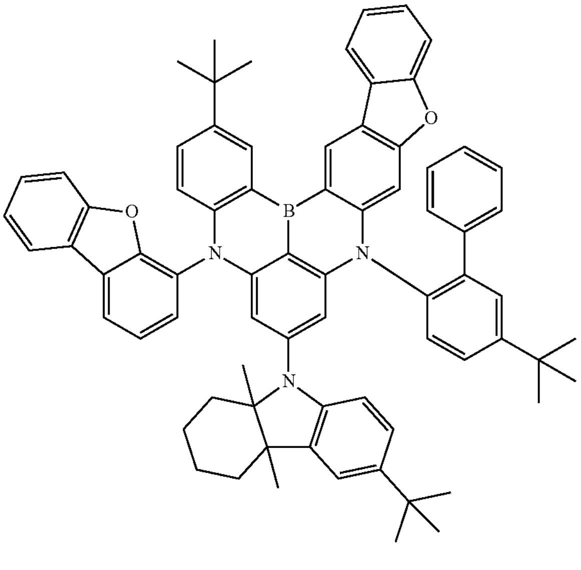

-continued
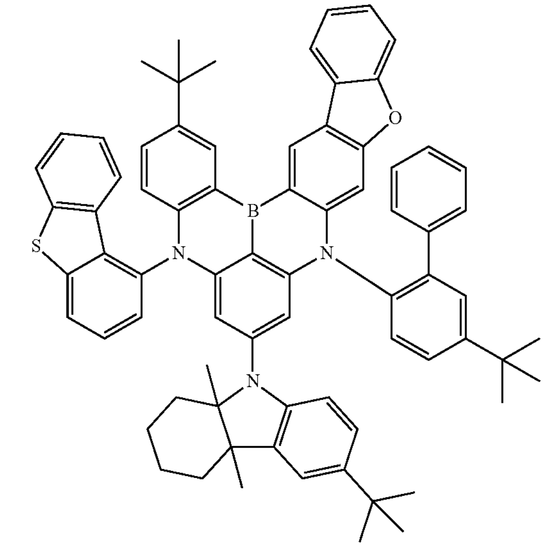
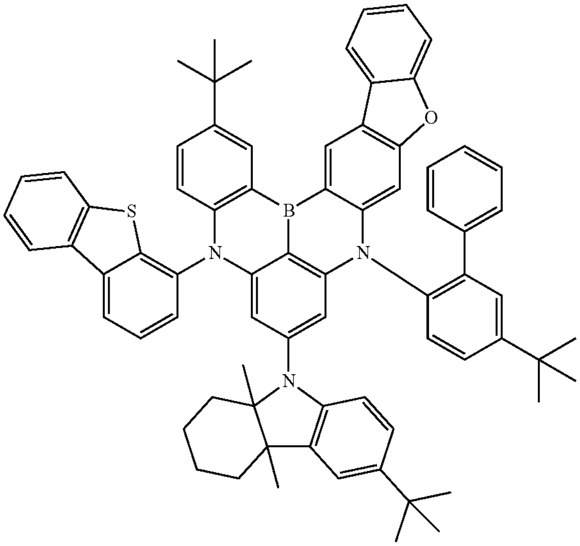 [SMILES: CC(C)(C)c1ccc2c(c1)B1c3cc4c(cc3N(c3ccc(C(C)(C)C)cc3-c3ccccc3)c3cc(N5c6ccc(C(C)(C)C)cc6C6(C)CCCCC56C)cc(c31)N2c1cccc2c1sc1ccccc12)oc1ccccc14]
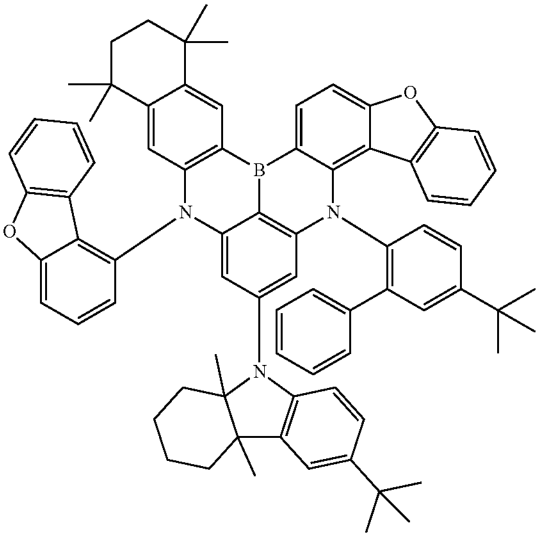
-continued
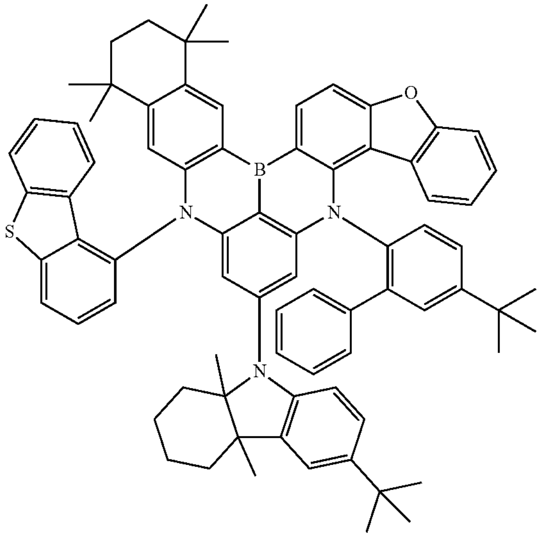
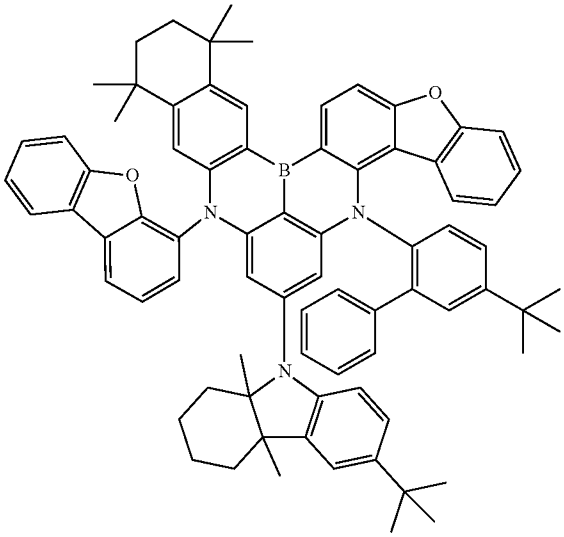
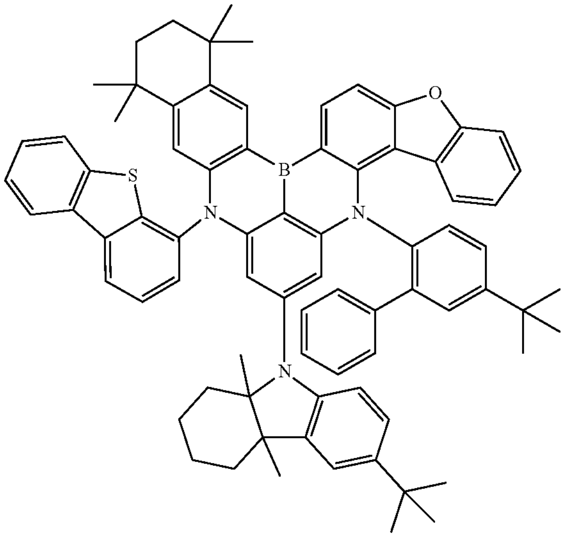

-continued
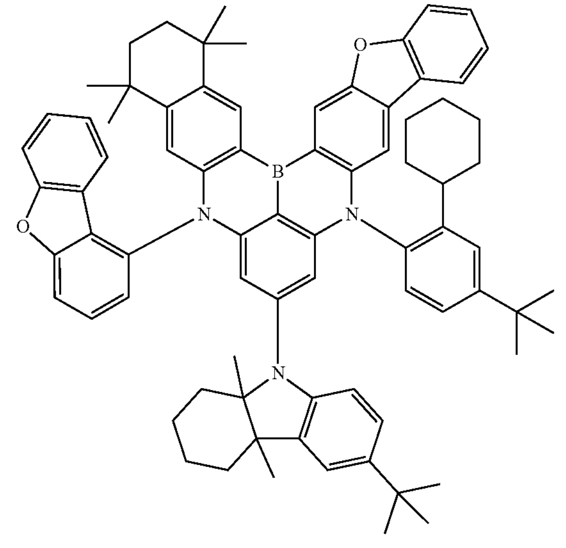
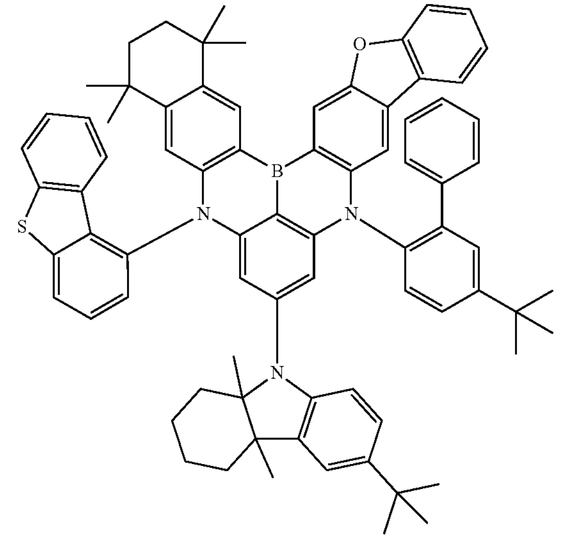
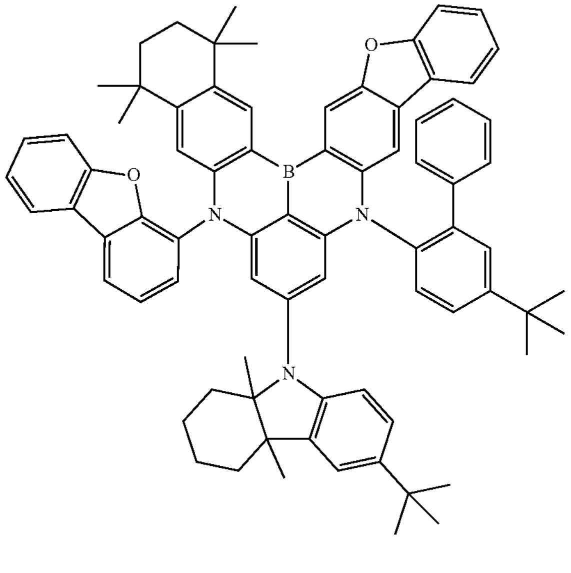
-continued
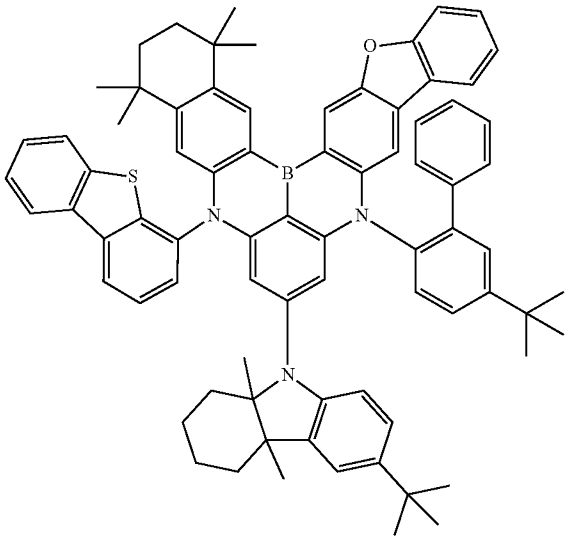
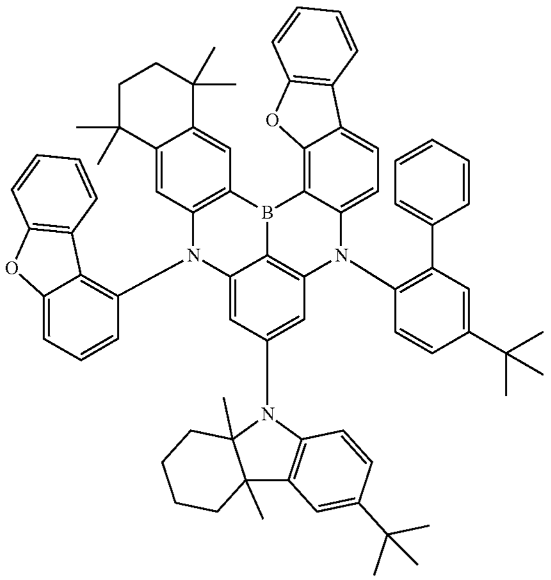
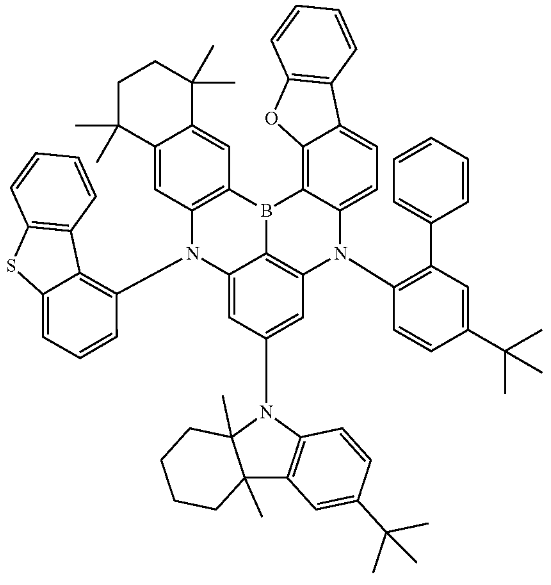

-continued
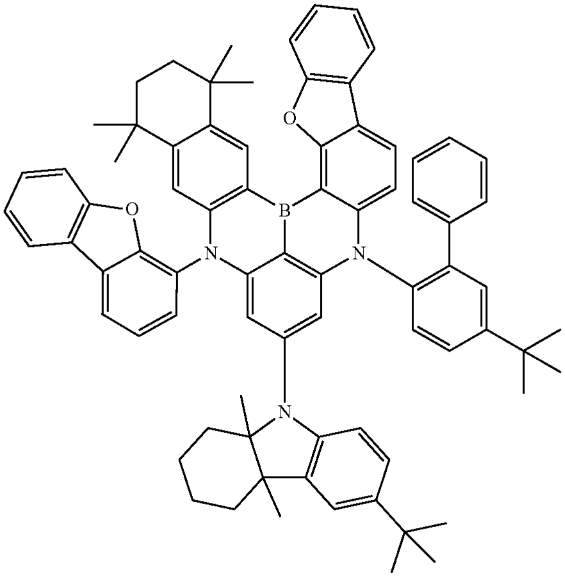
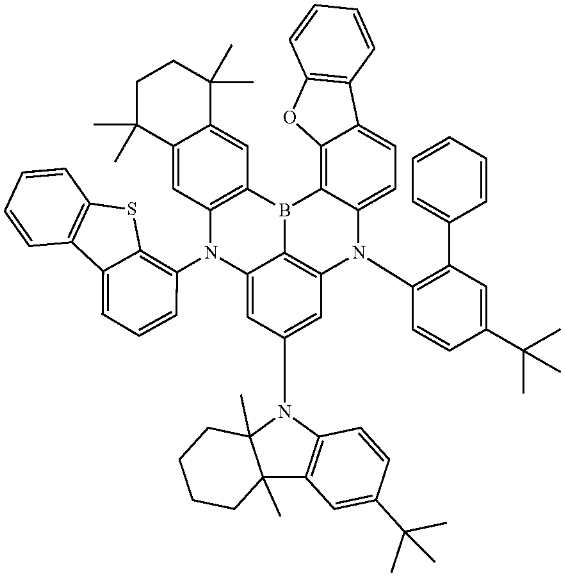
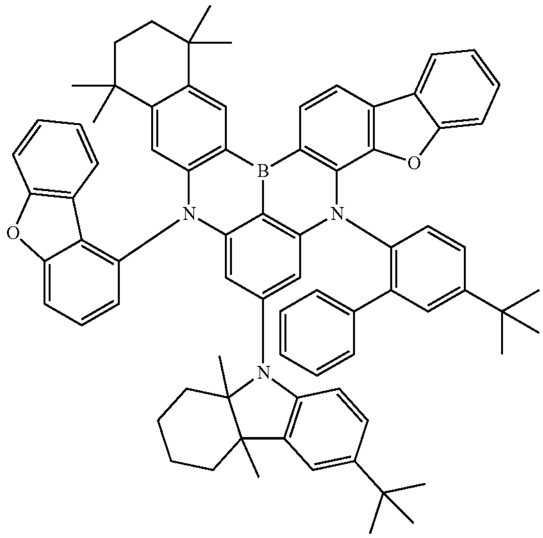
-continued
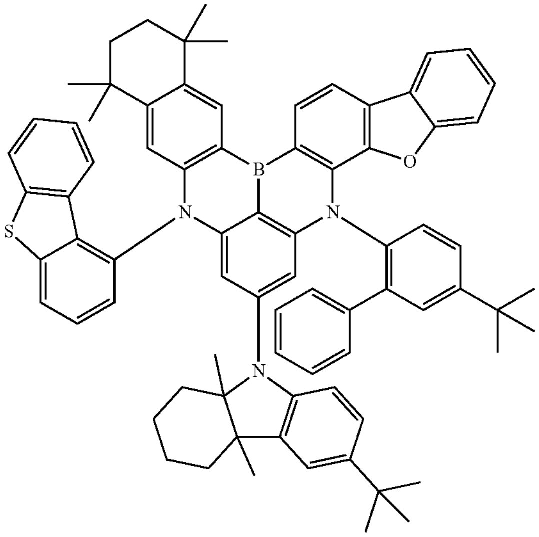
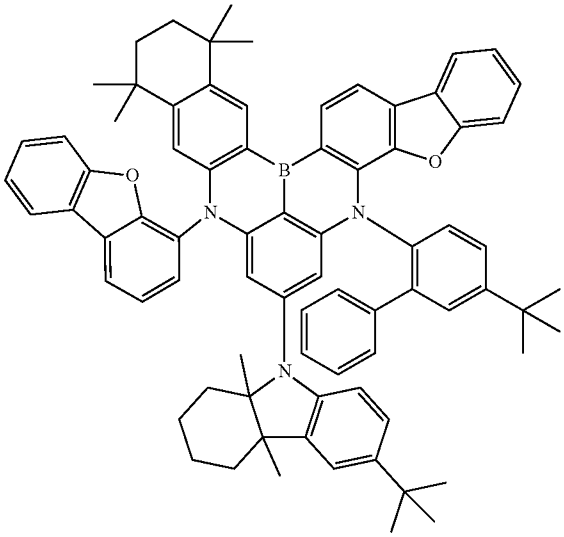
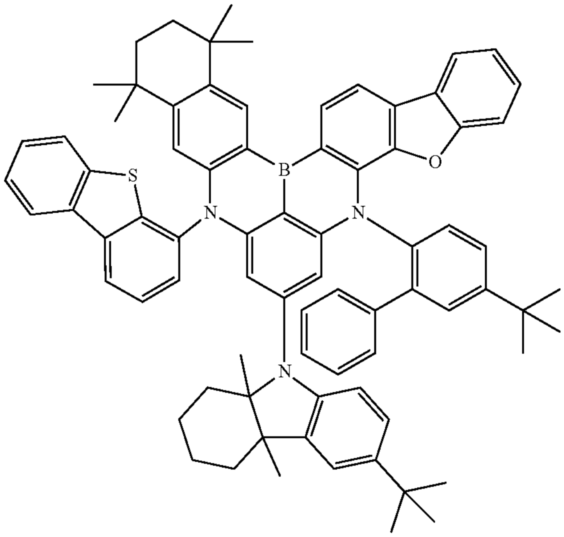

-continued
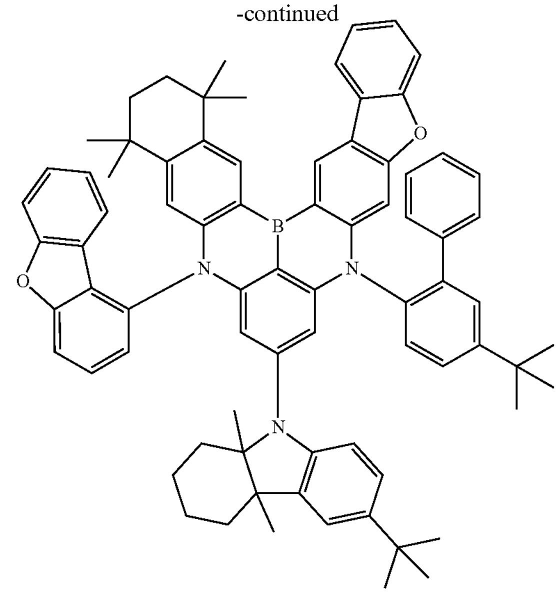
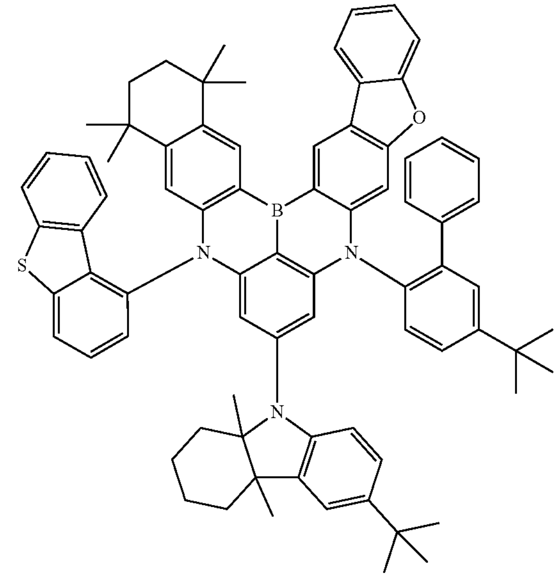
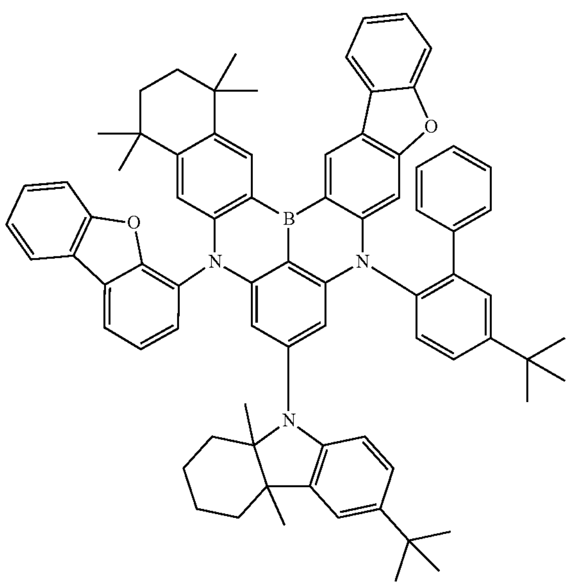
-continued
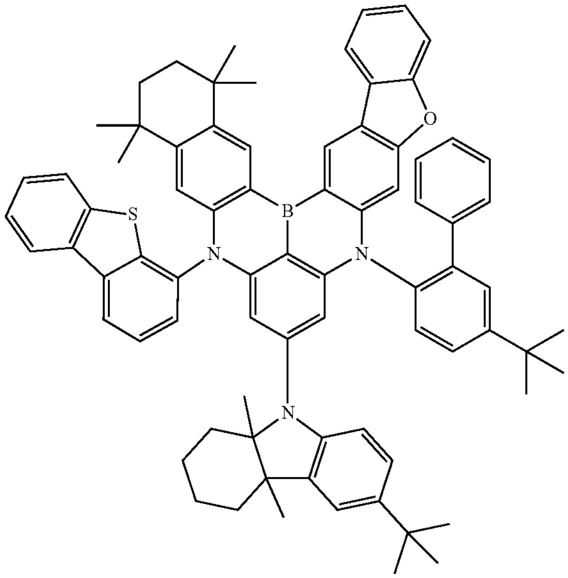
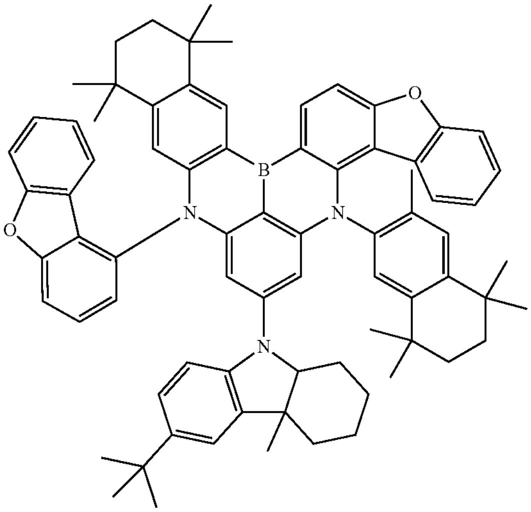
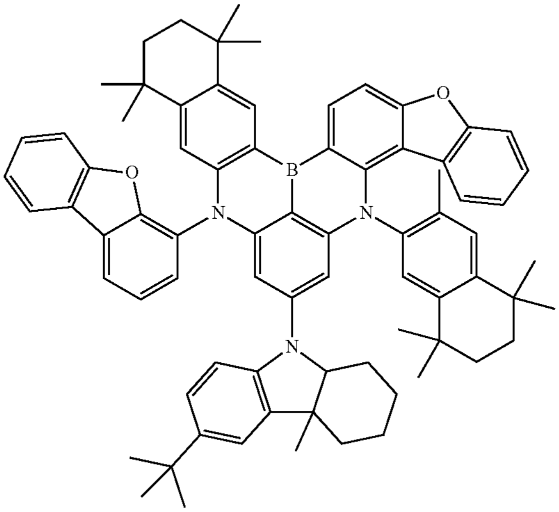

-continued
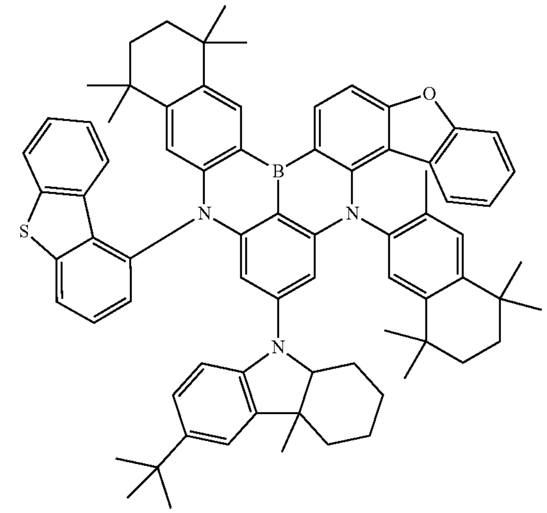
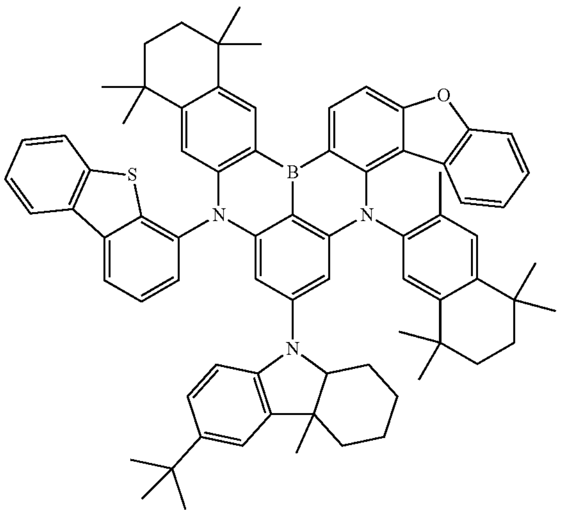
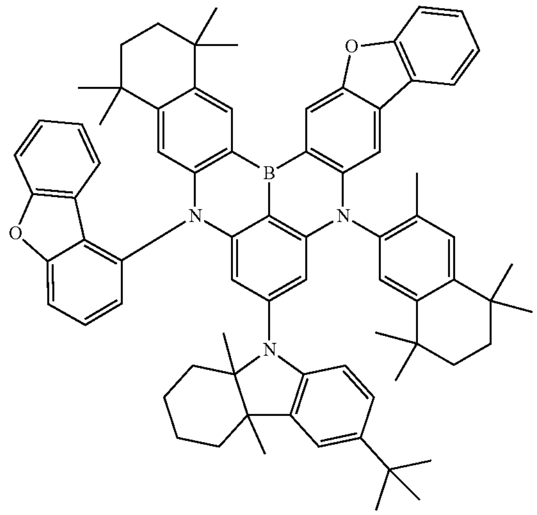
-continued
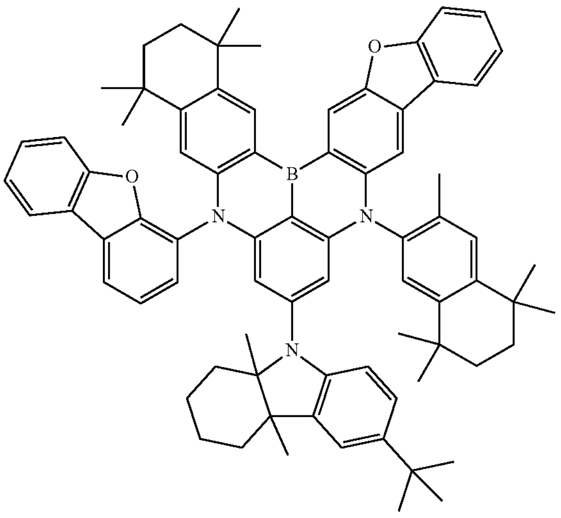
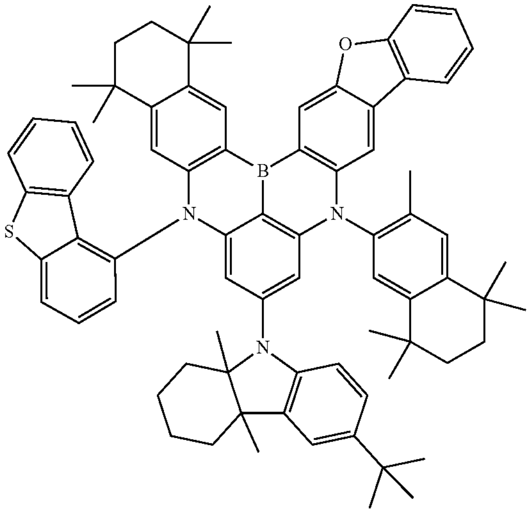
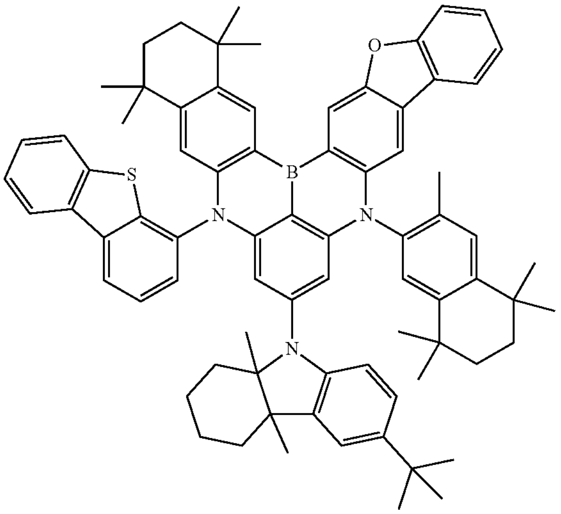

-continued
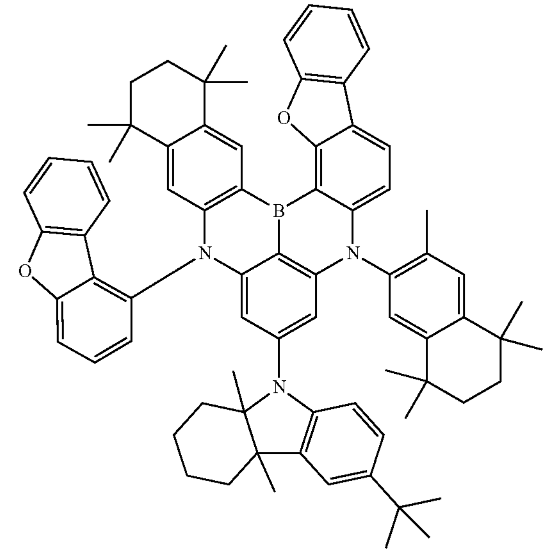
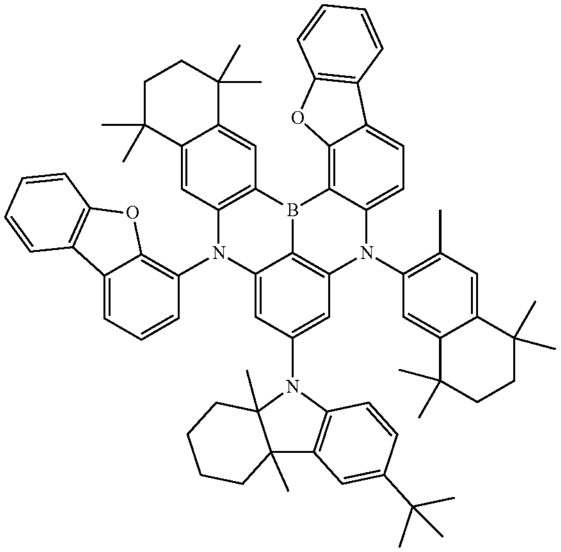
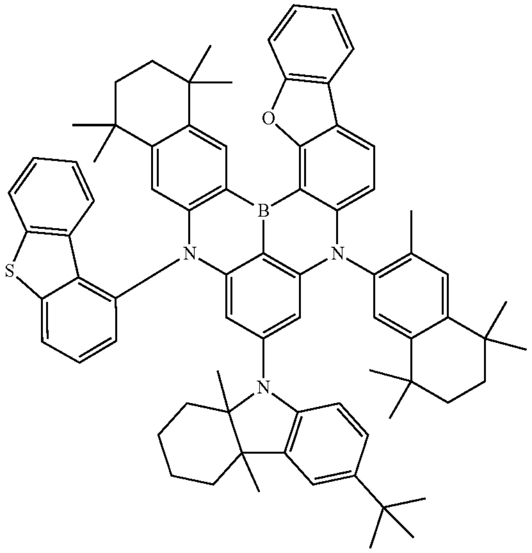
-continued
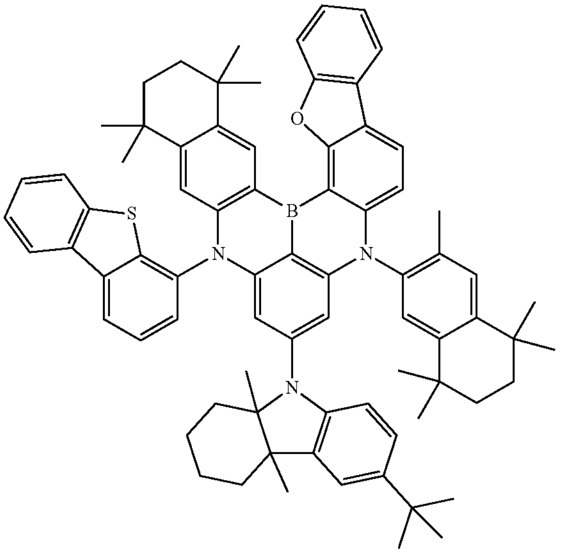
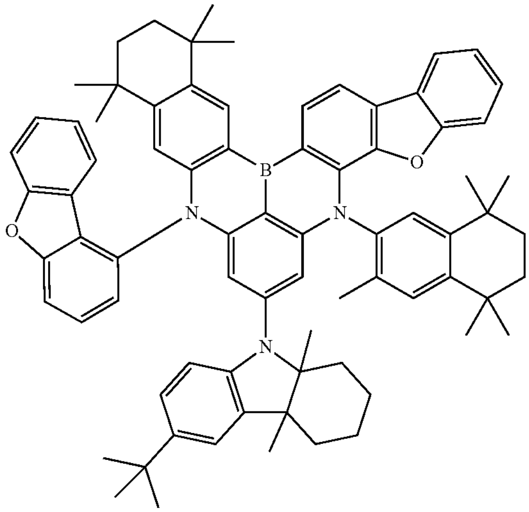
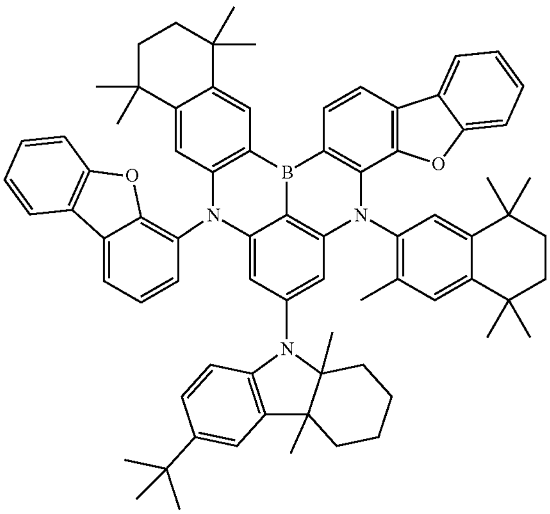

-continued
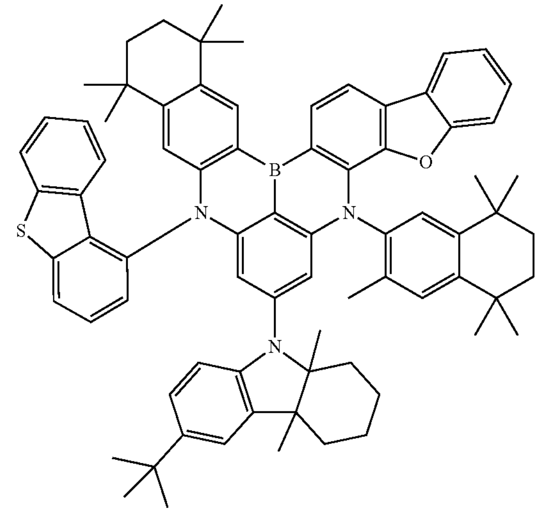
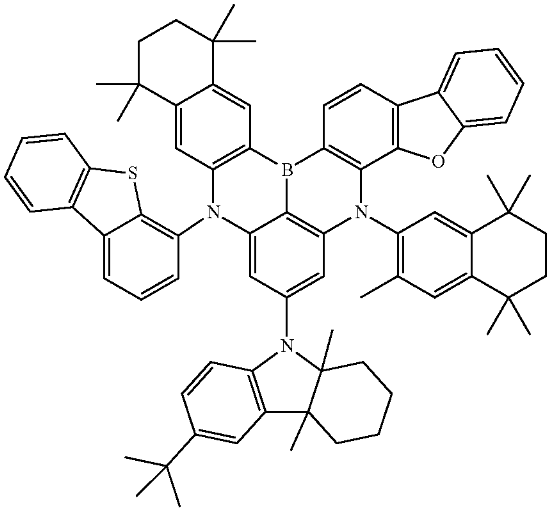
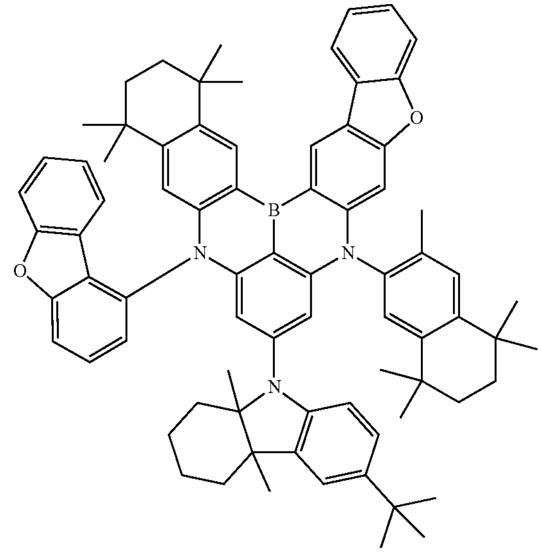
-continued
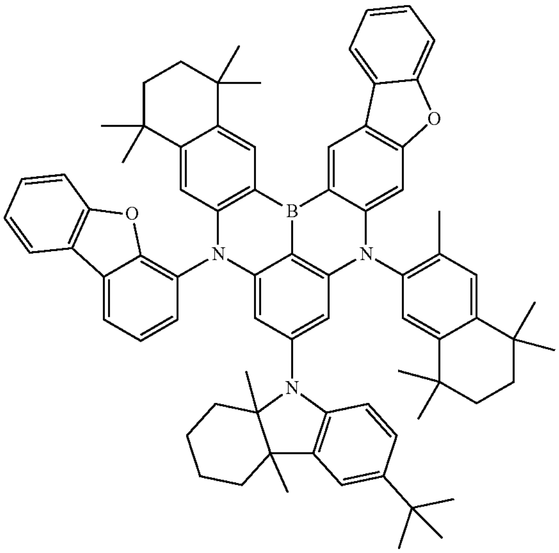
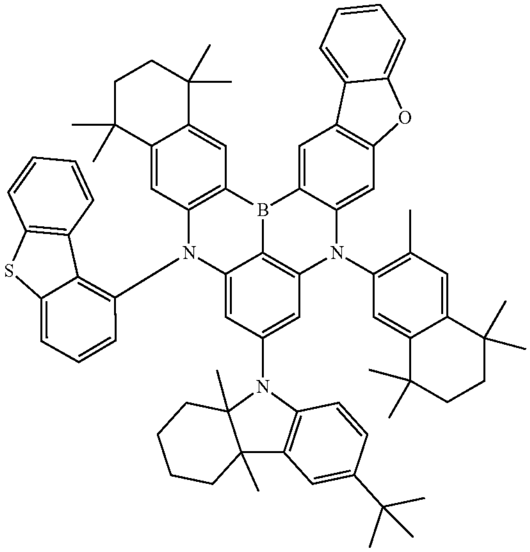
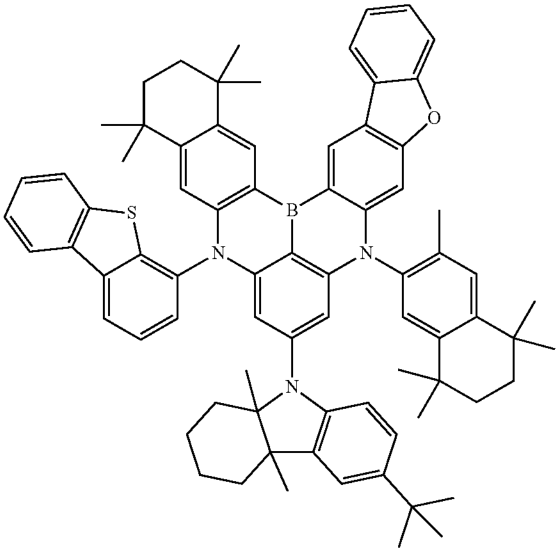

-continued
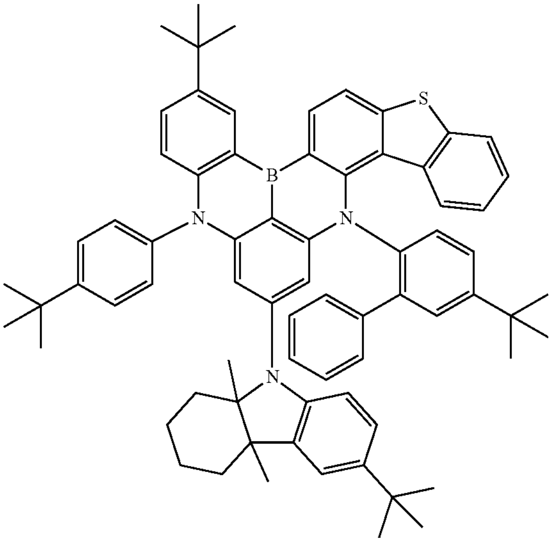
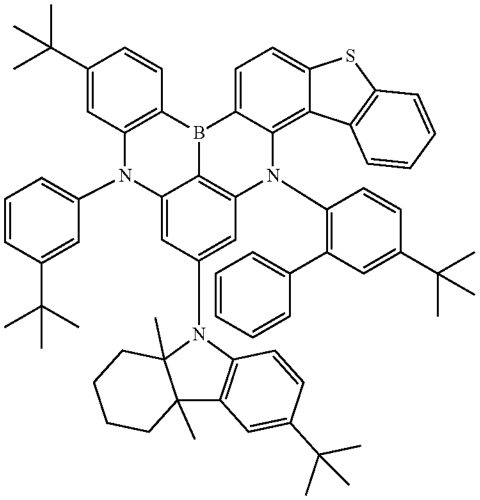
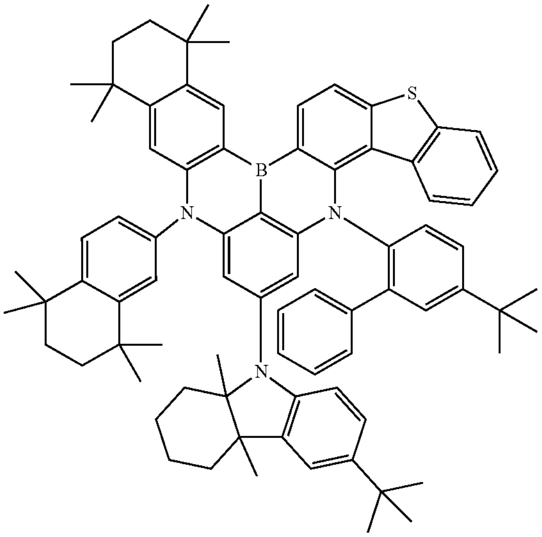
-continued
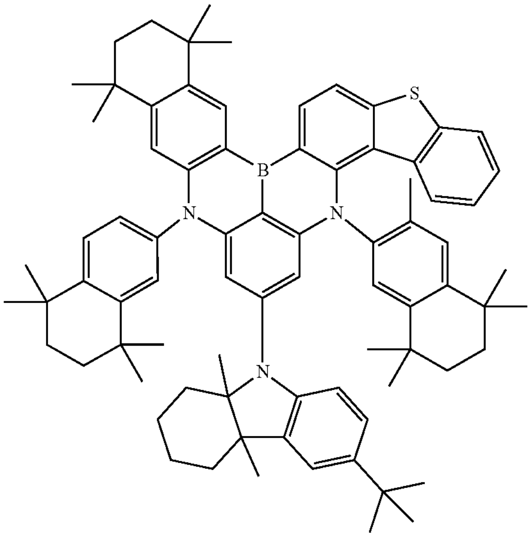
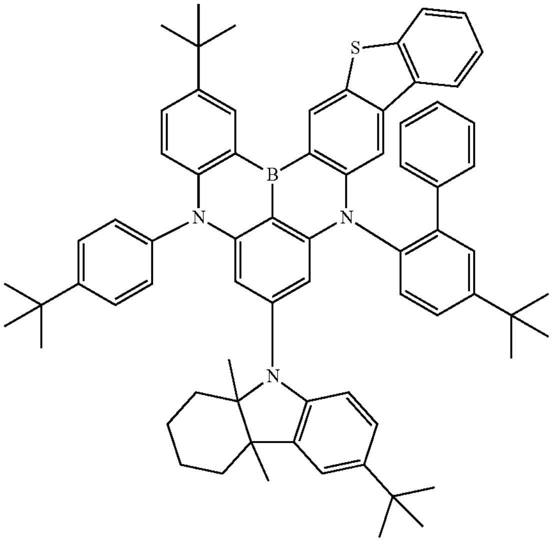
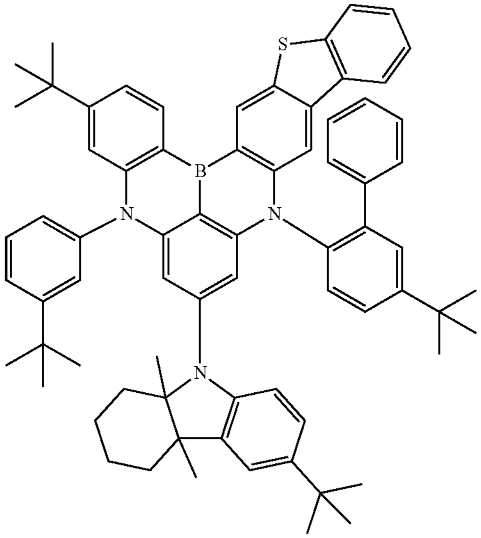

-continued
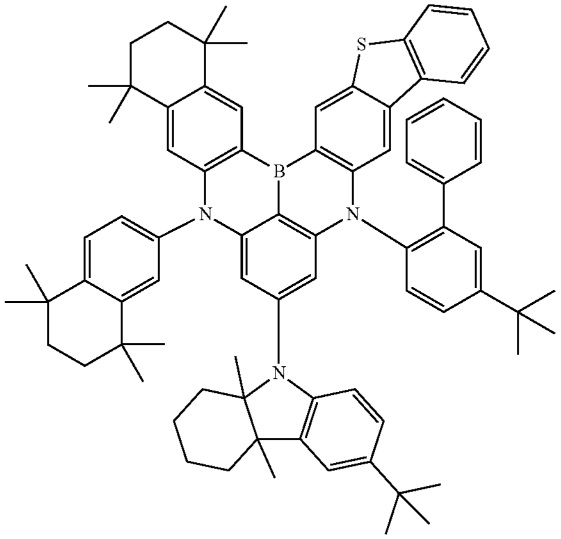
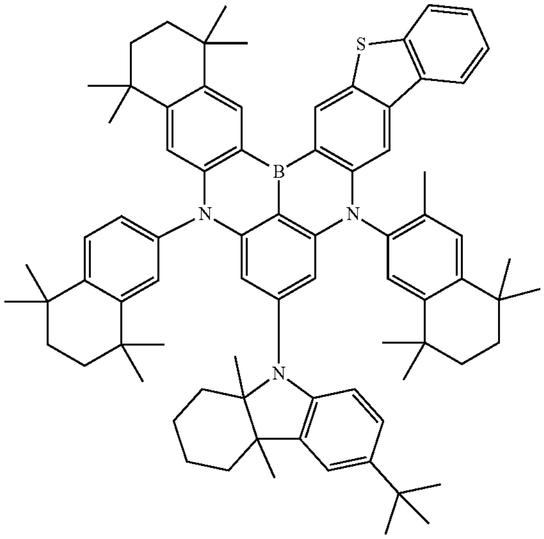
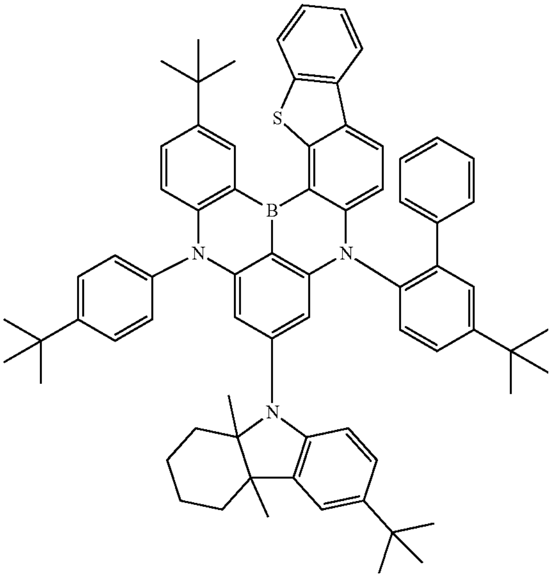
-continued
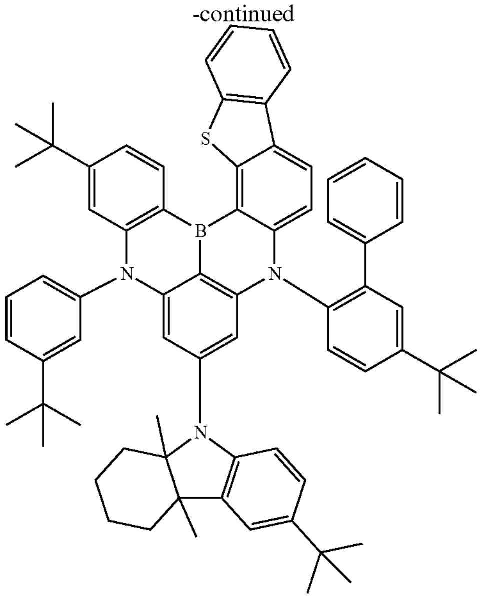
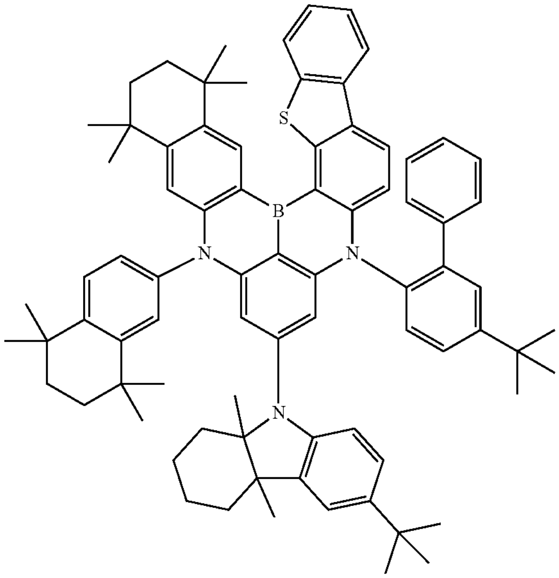
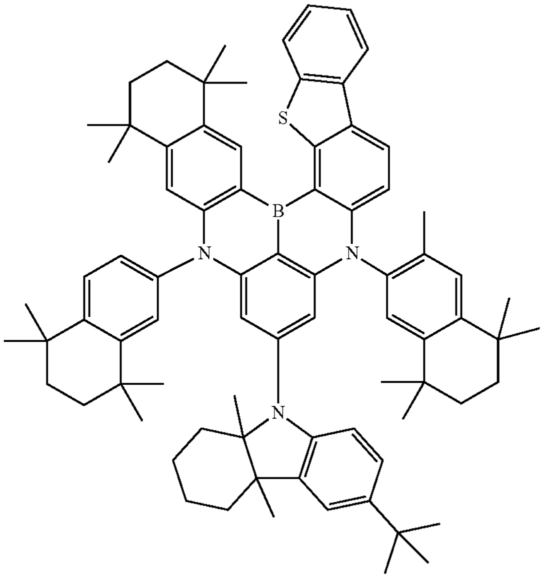

-continued
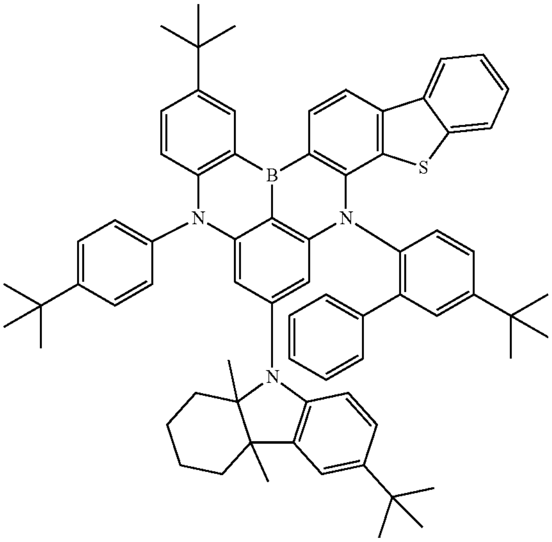
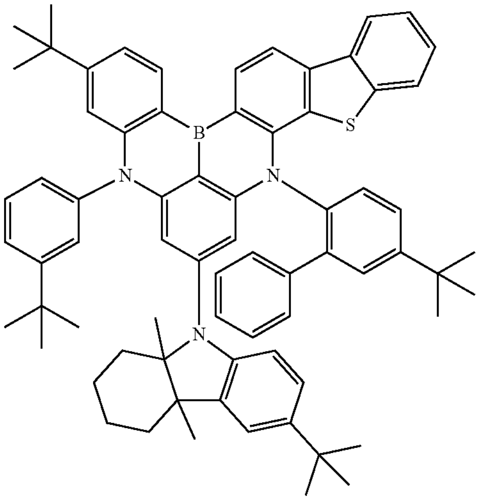
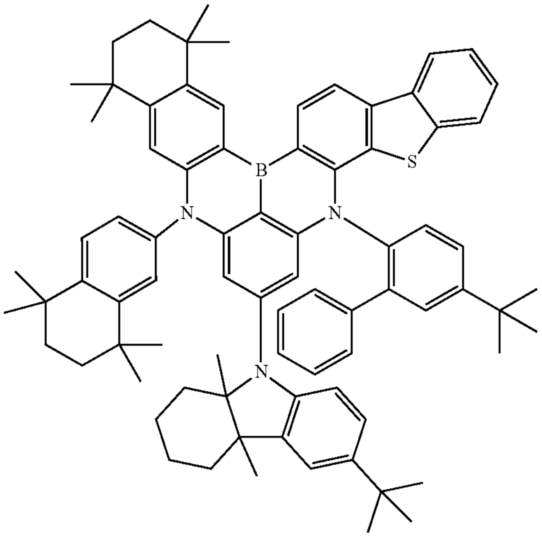
-continued
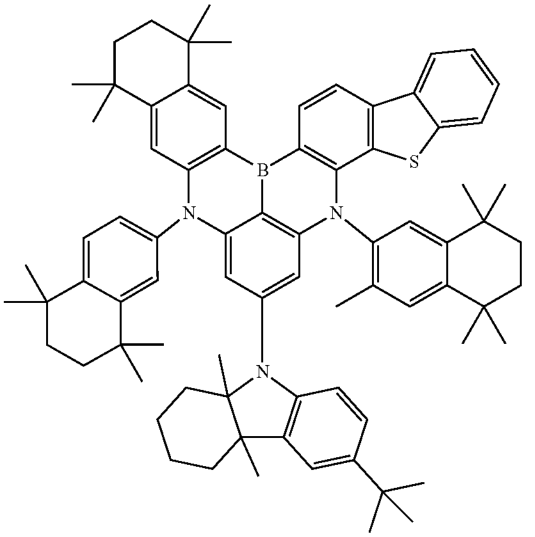
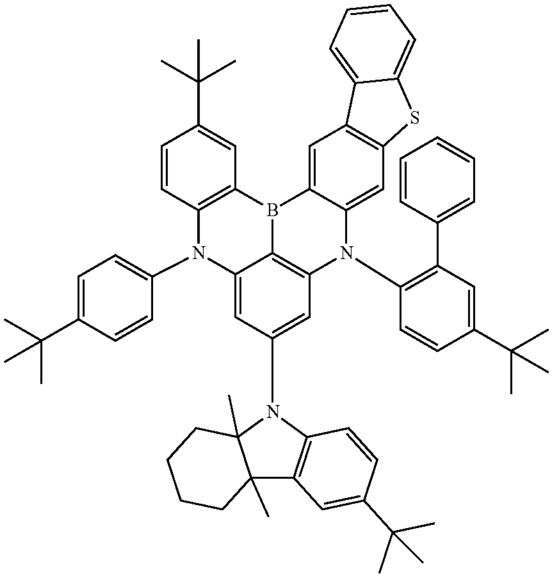
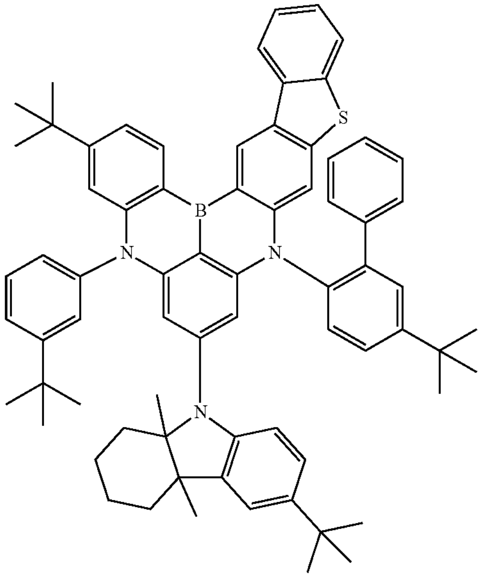

-continued
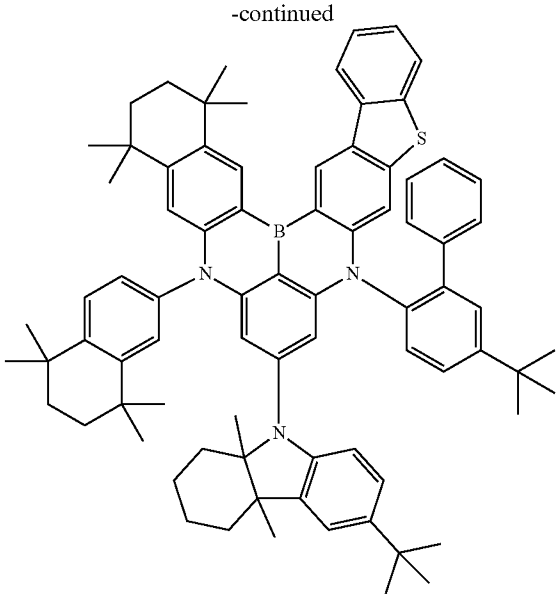
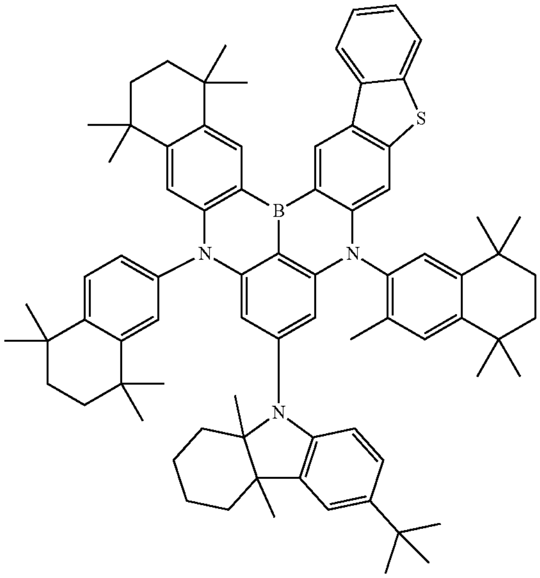
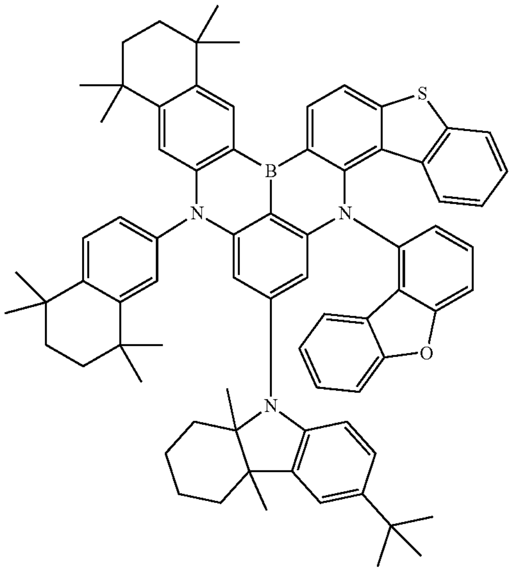
-continued
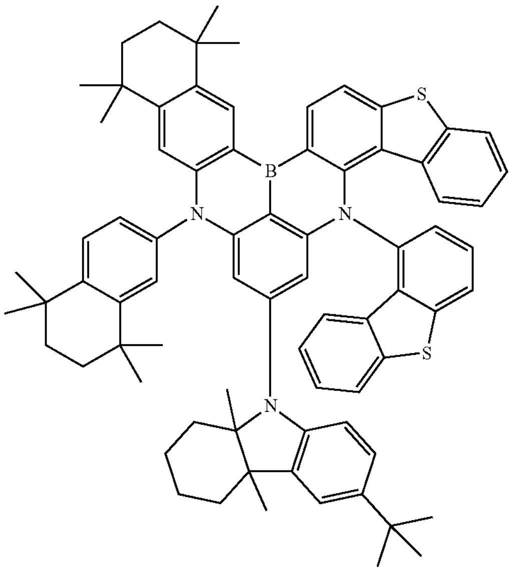
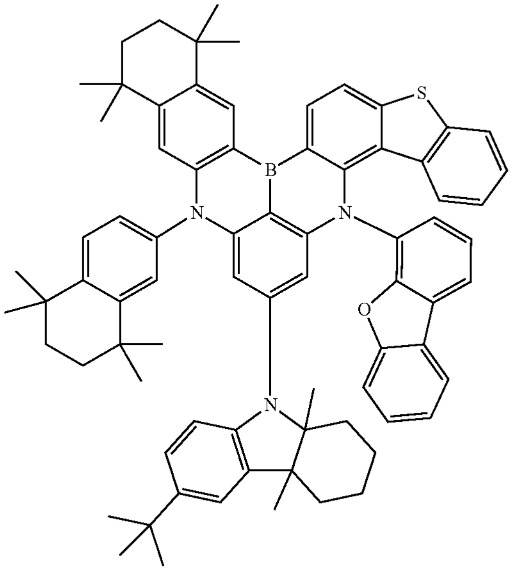
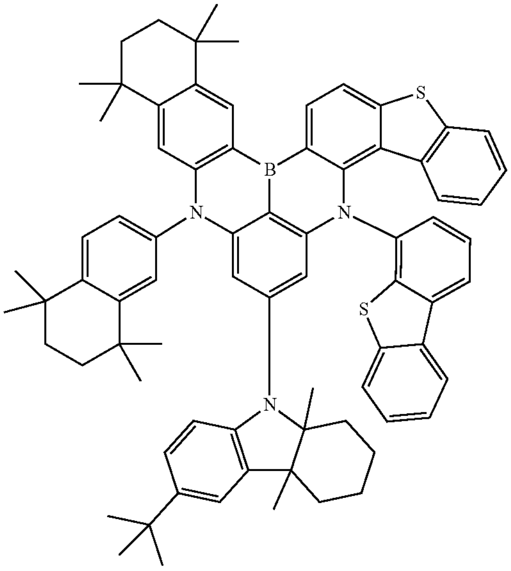

-continued
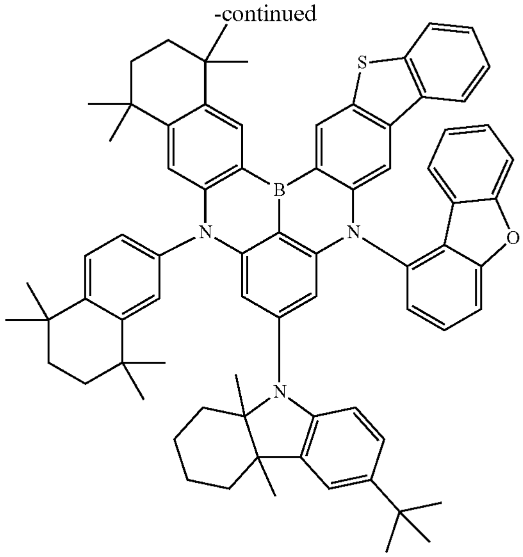
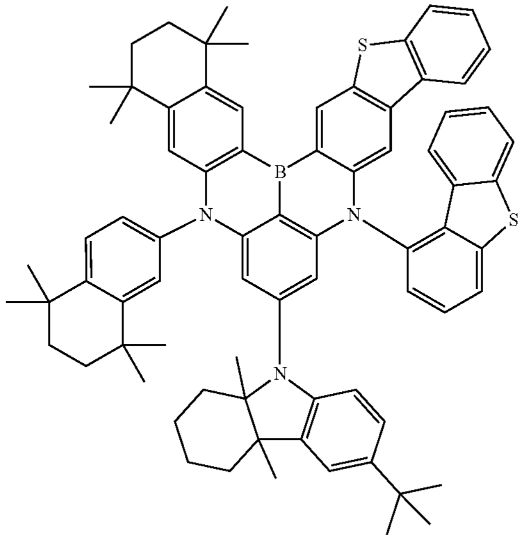
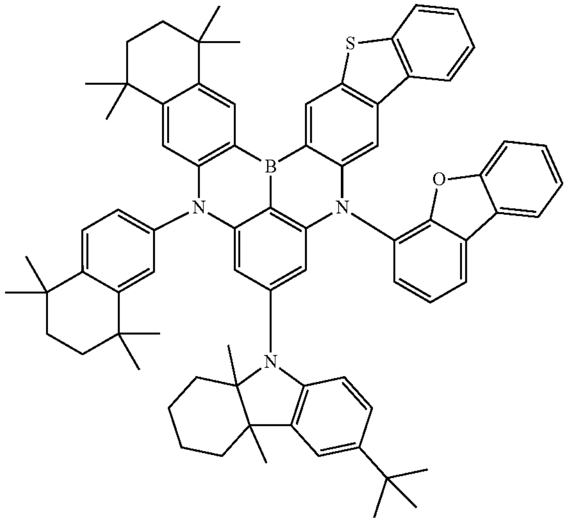
-continued
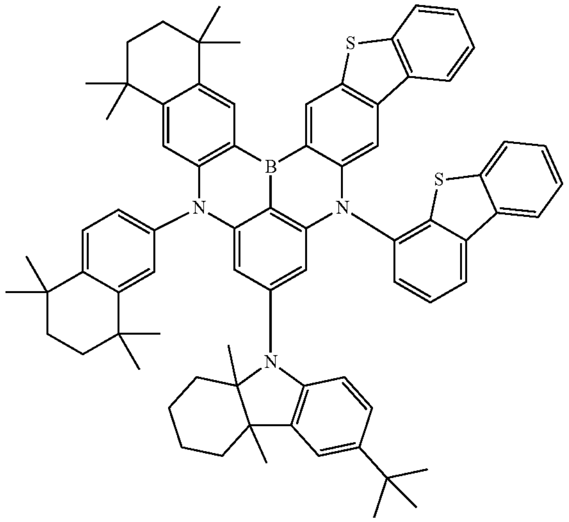
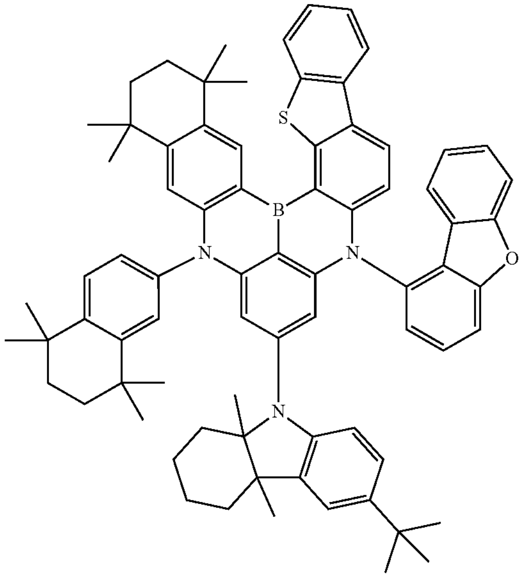
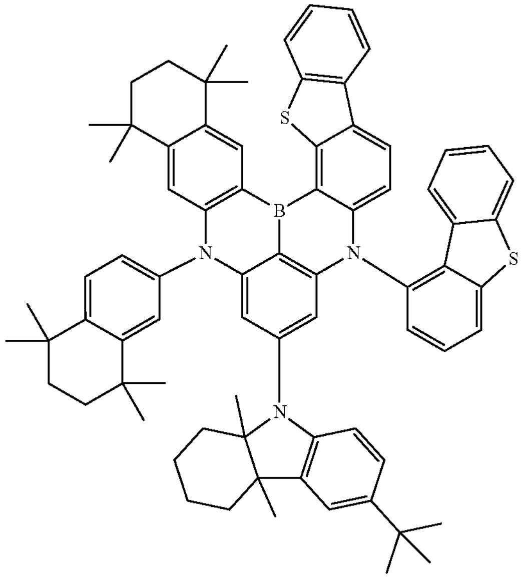

-continued
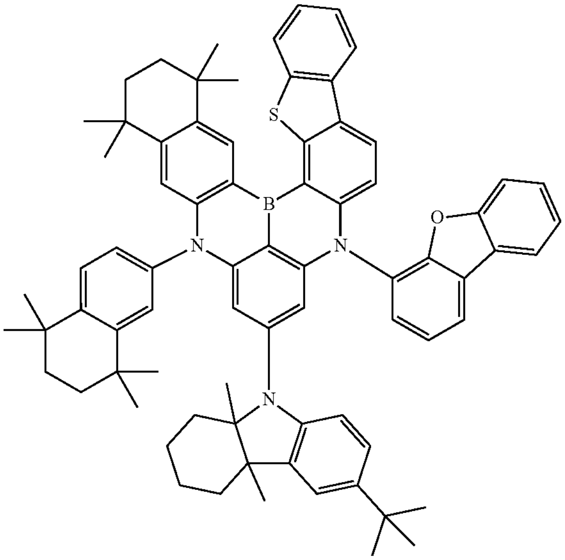
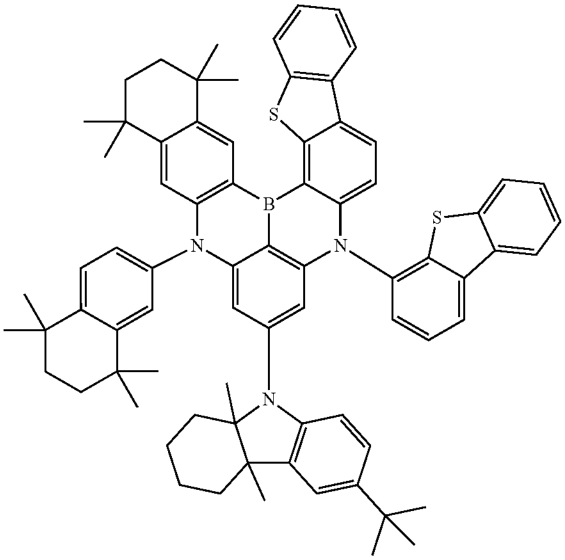
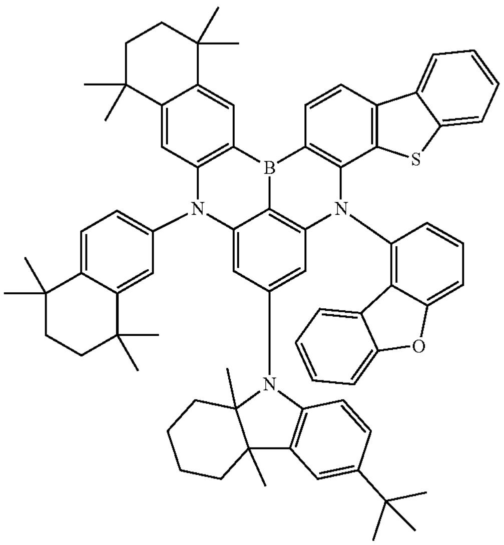
-continued
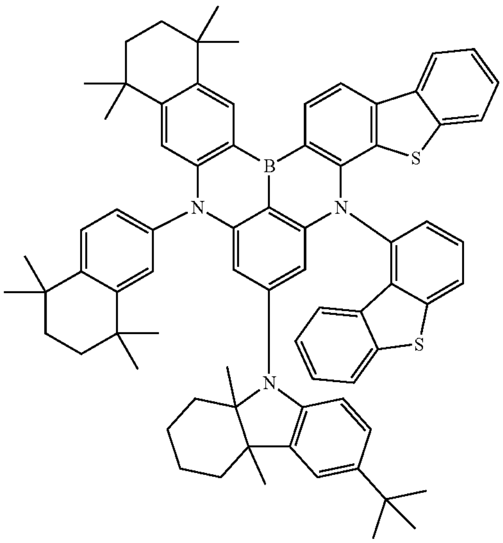
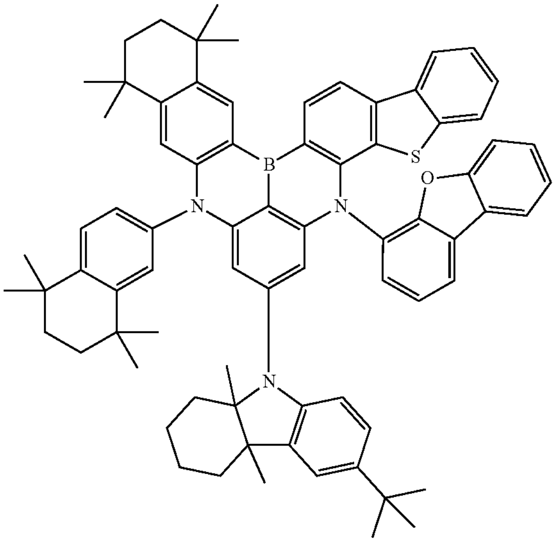
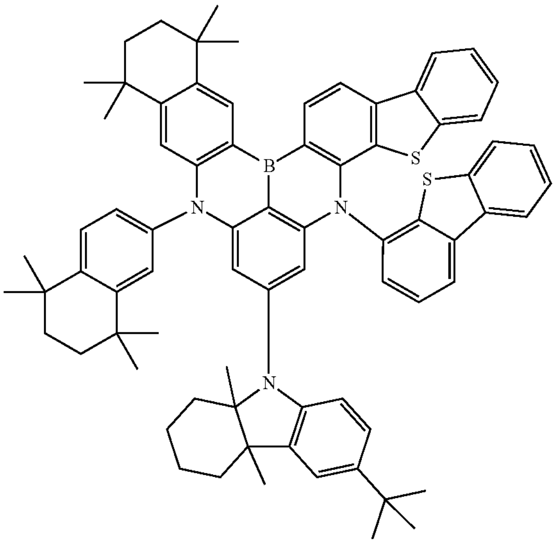

-continued
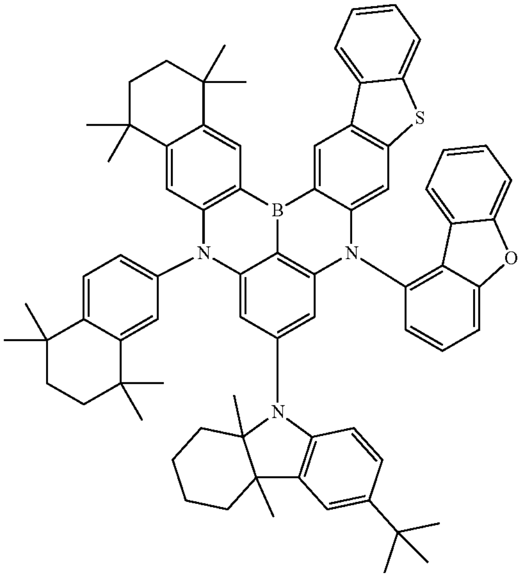
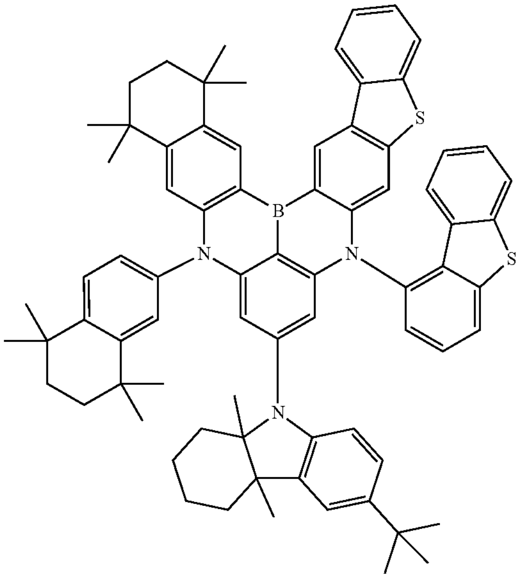
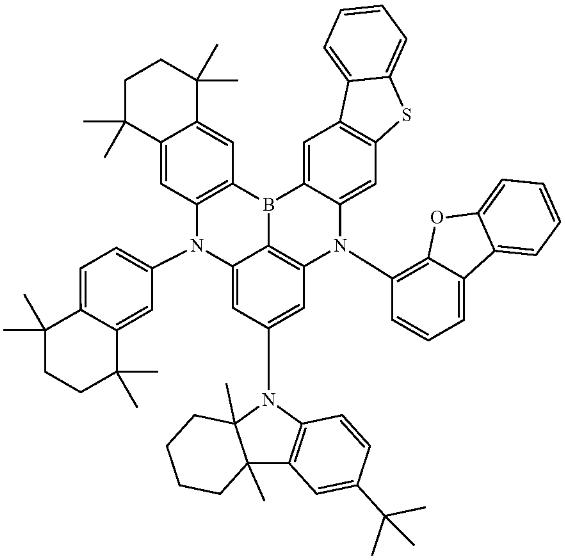
-continued
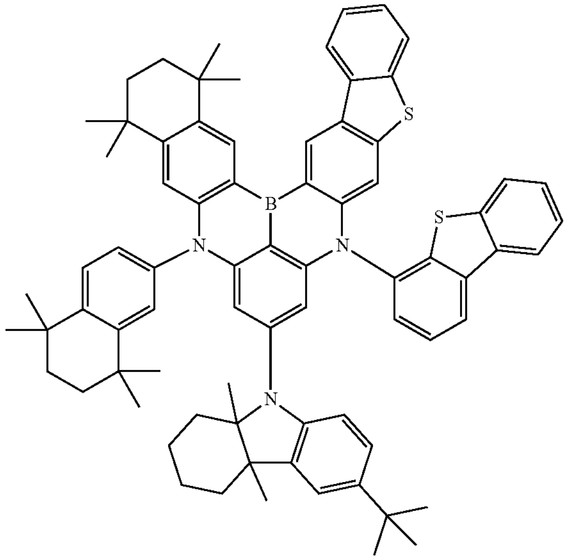
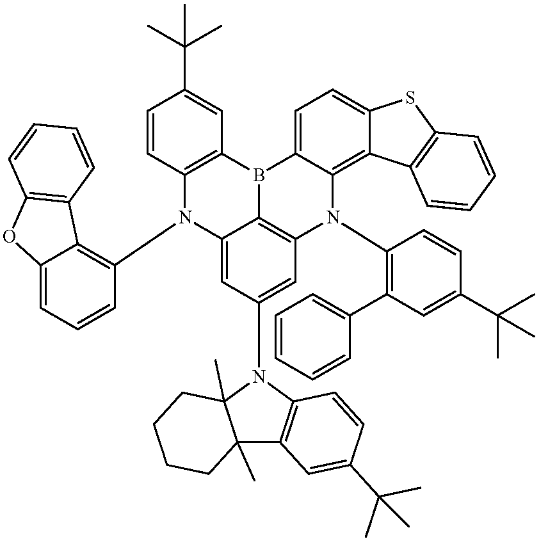
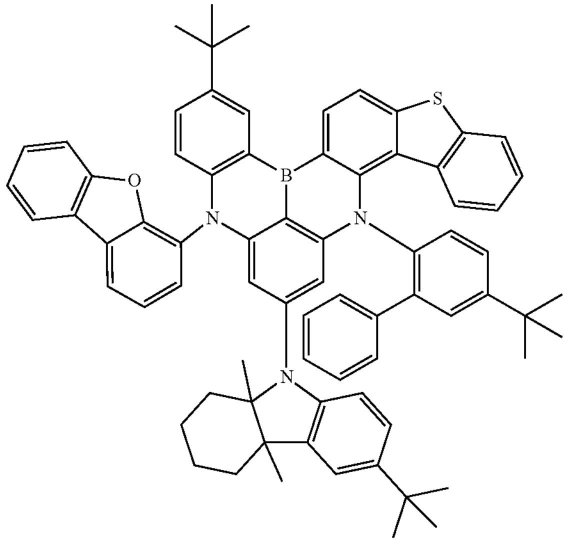

-continued
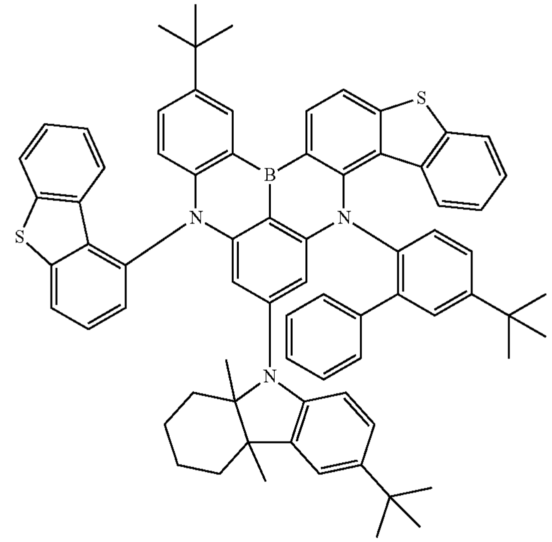
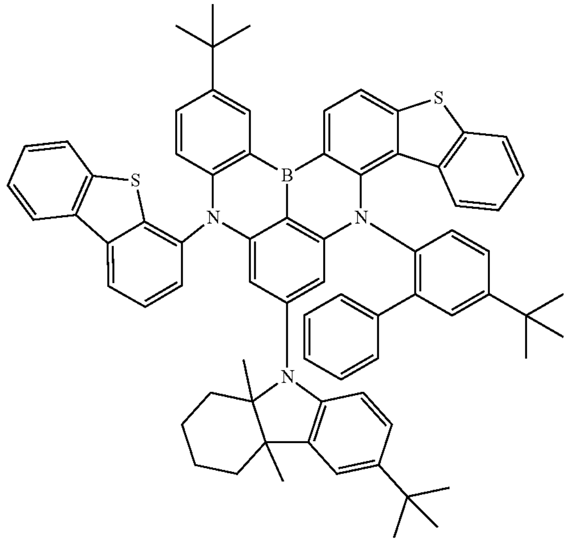
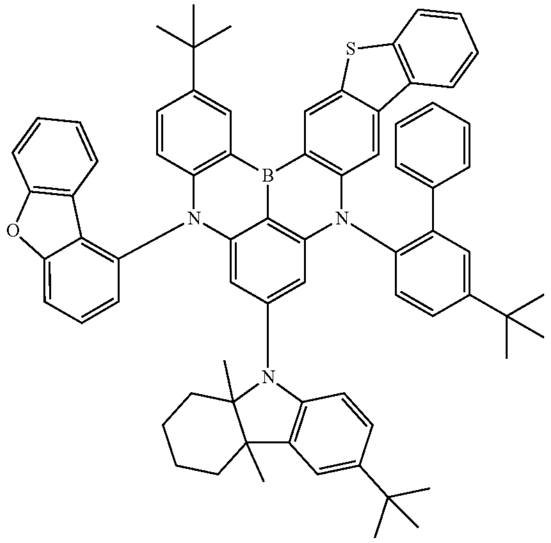
-continued
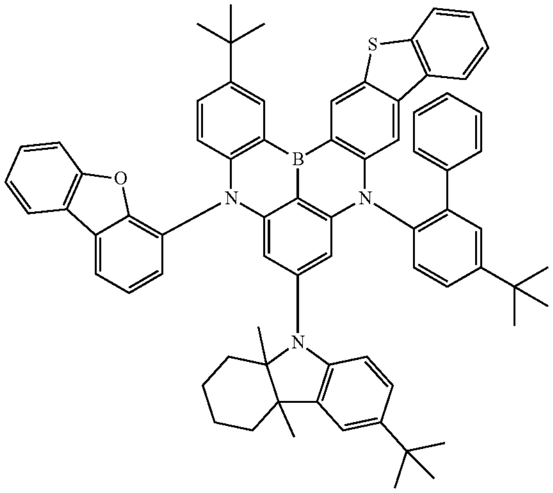
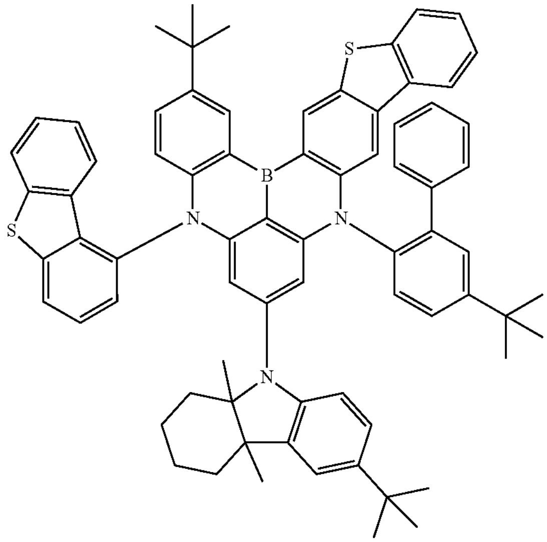
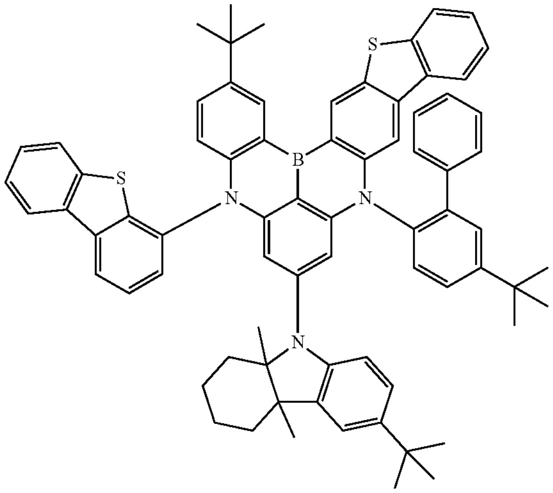

-continued
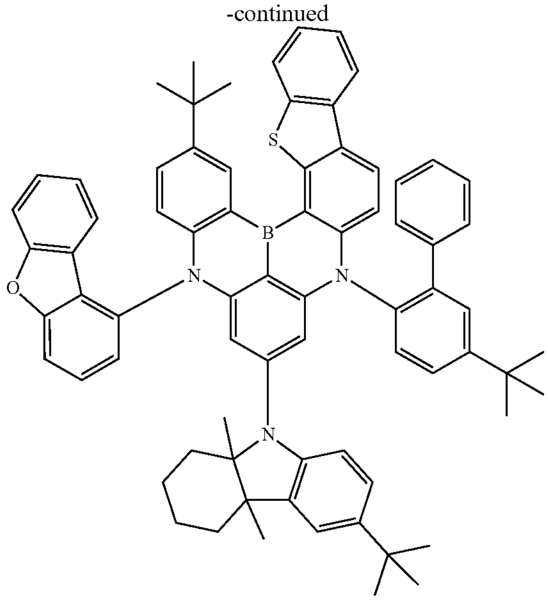
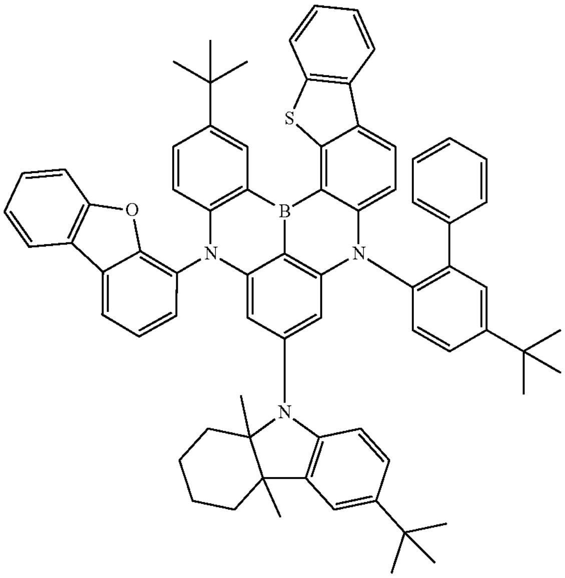
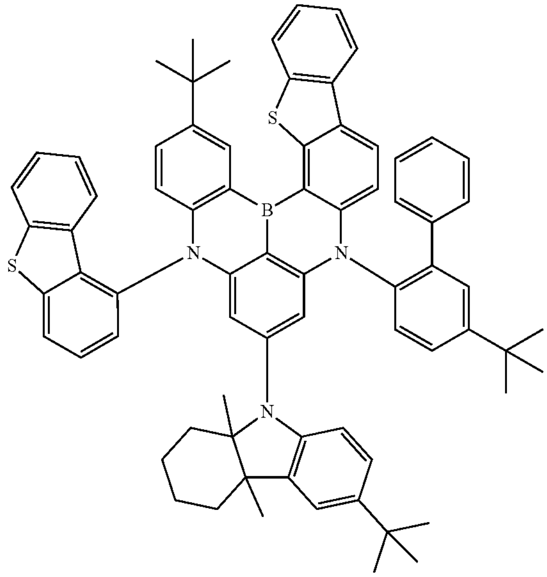
-continued
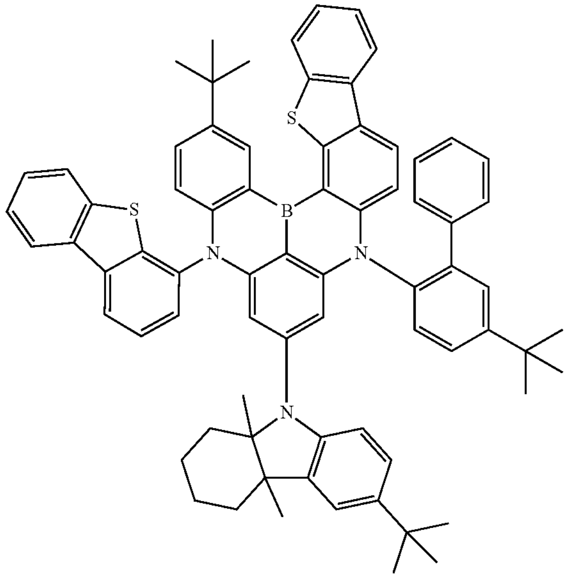
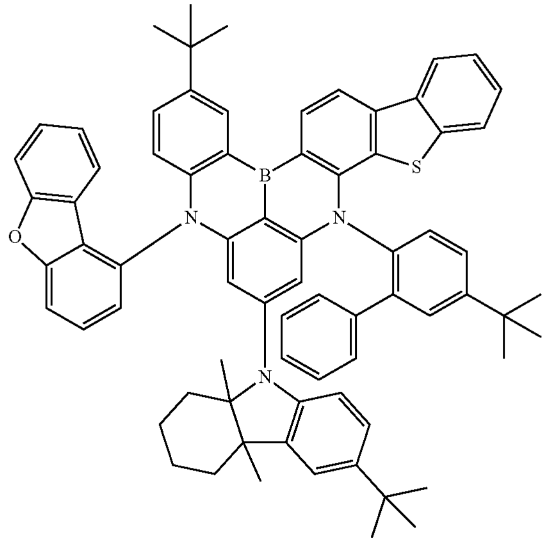
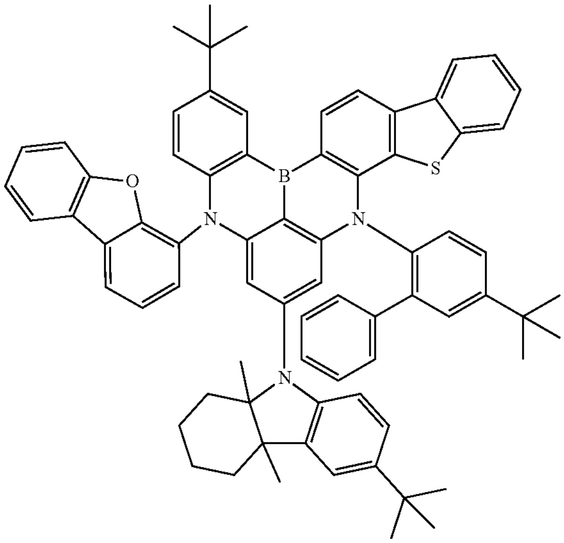

-continued
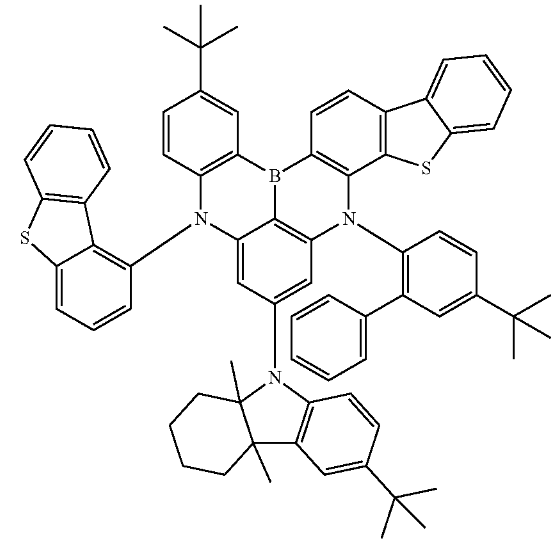
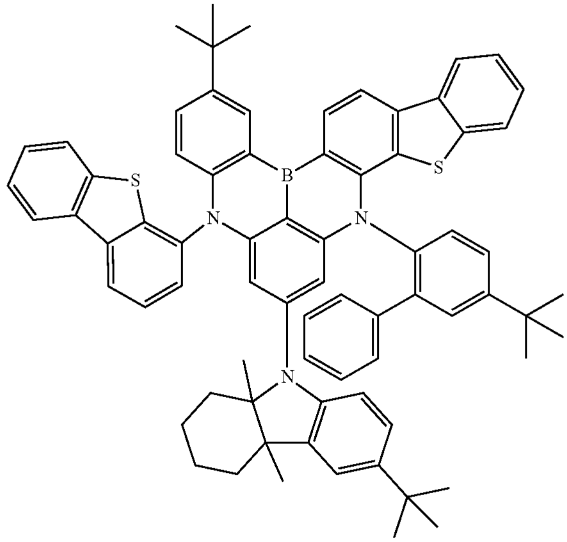
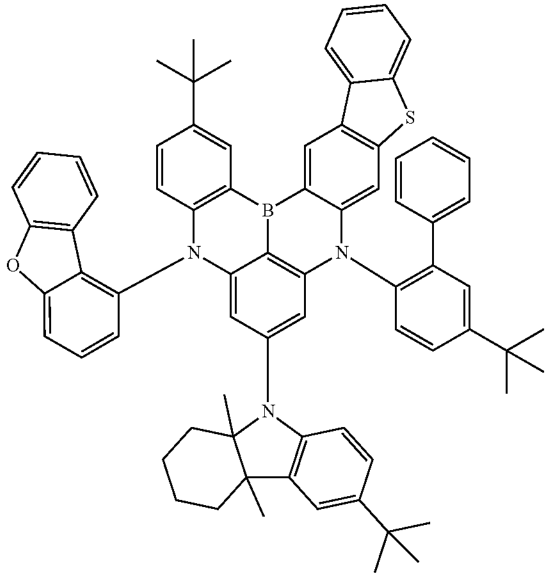
-continued
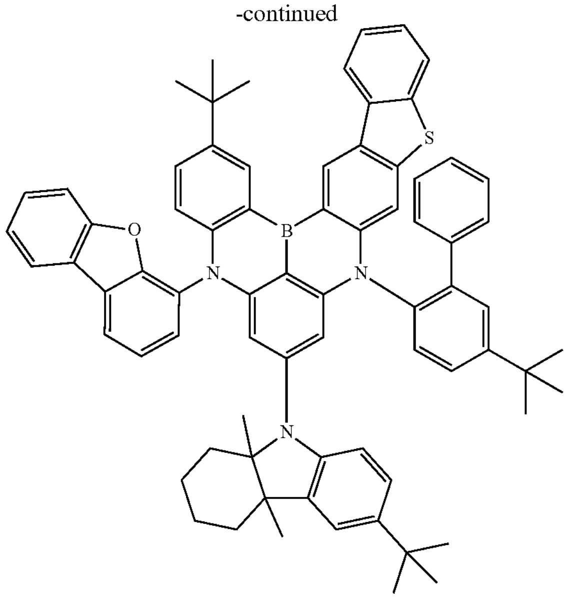
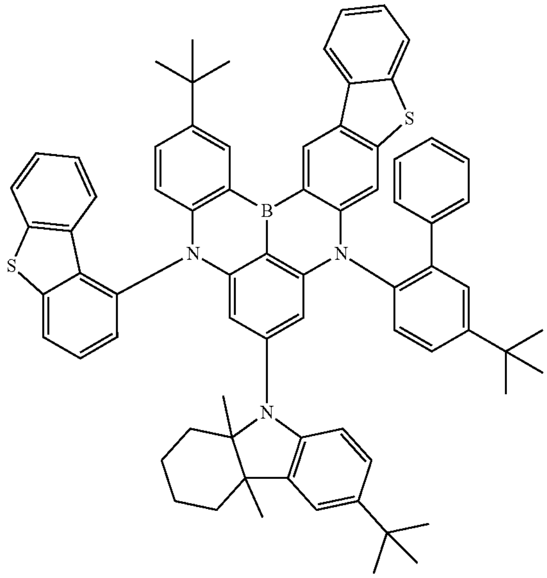
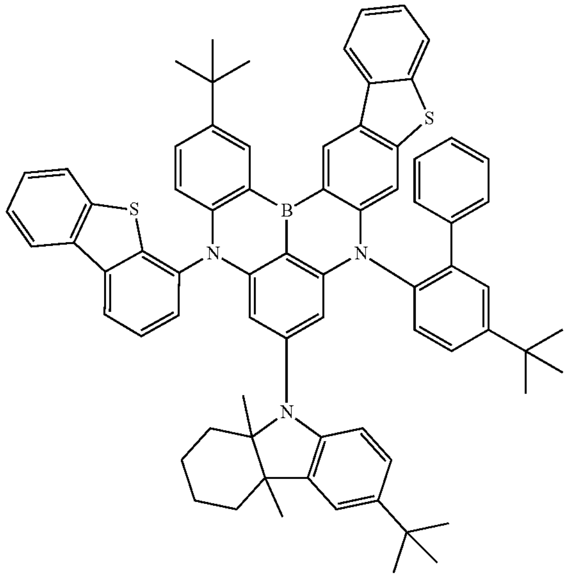

-continued
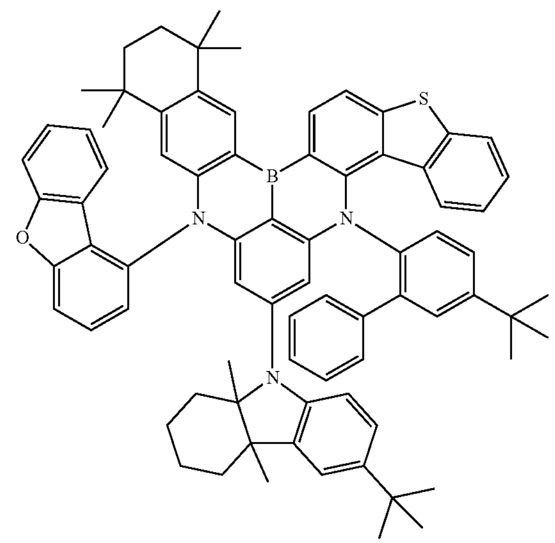
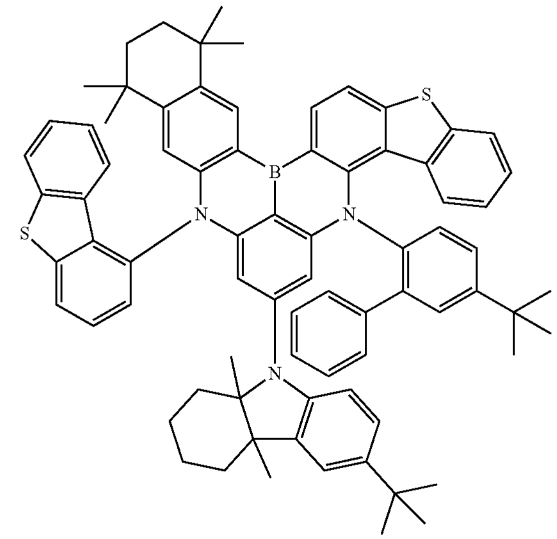
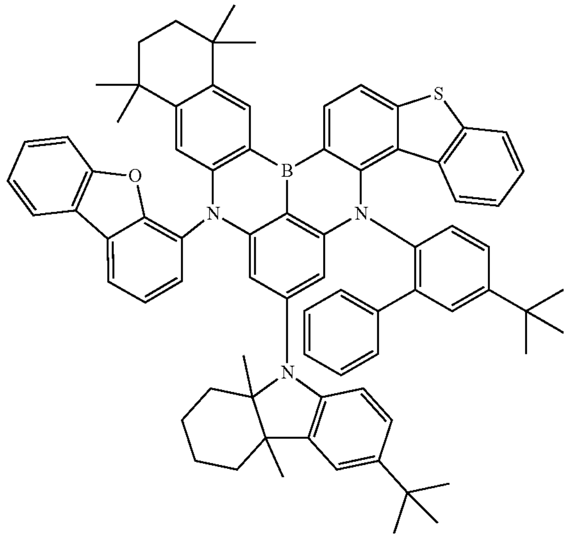
-continued
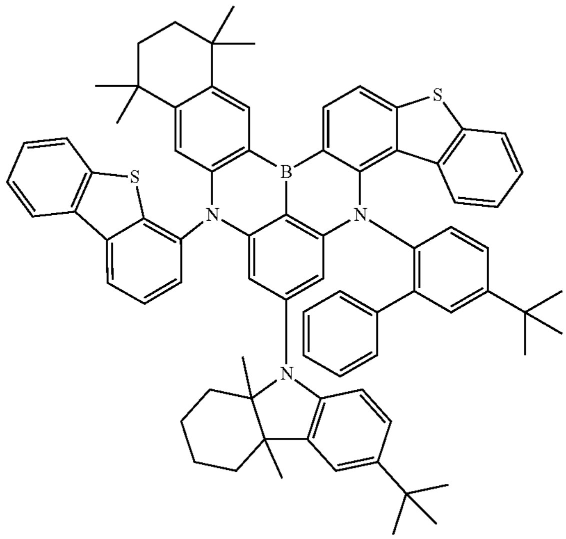
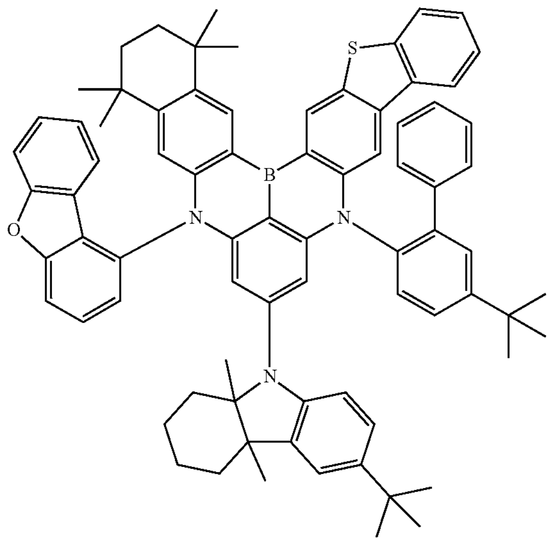
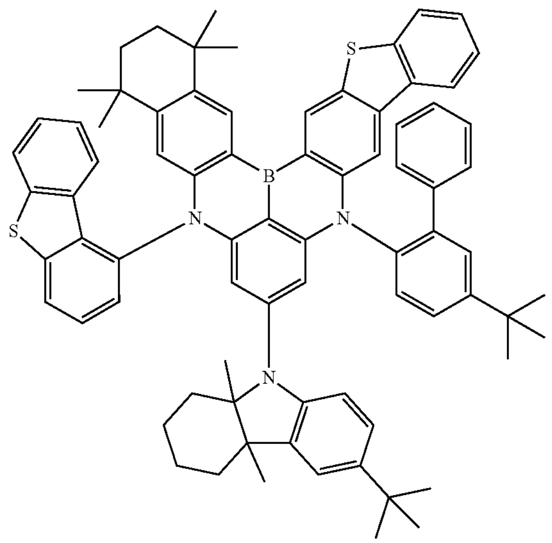

-continued
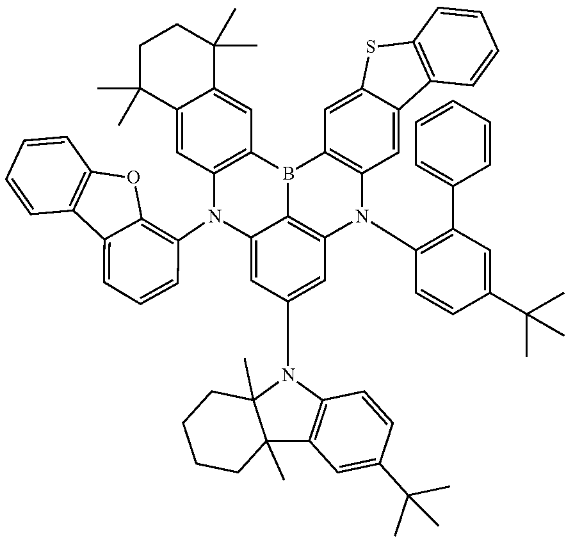
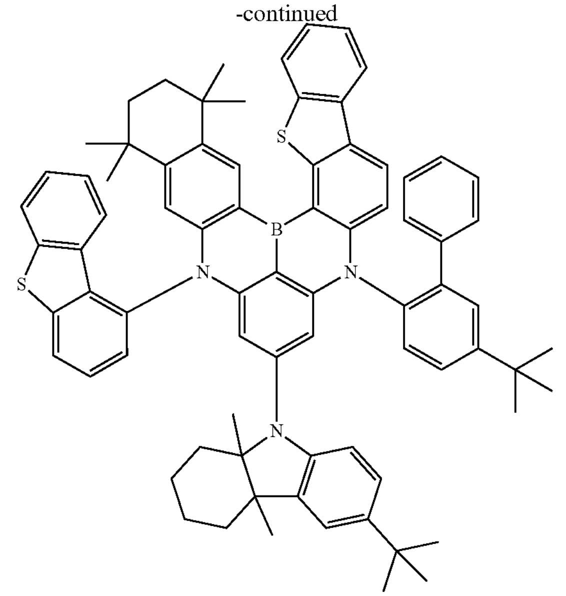
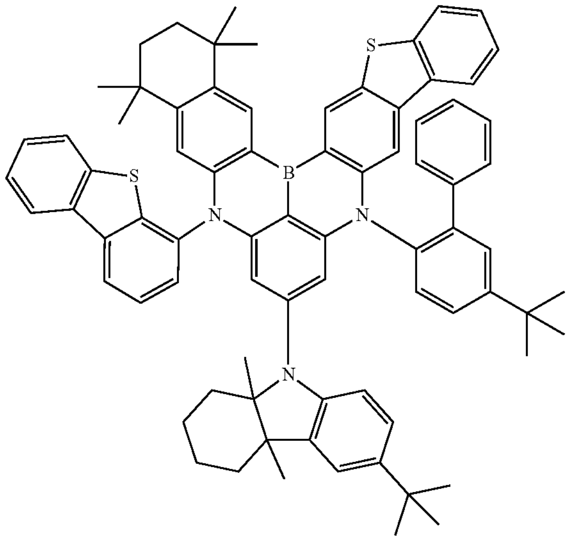
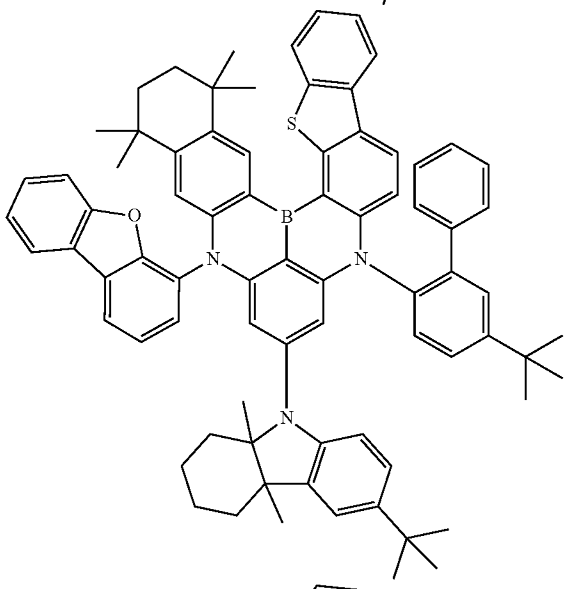
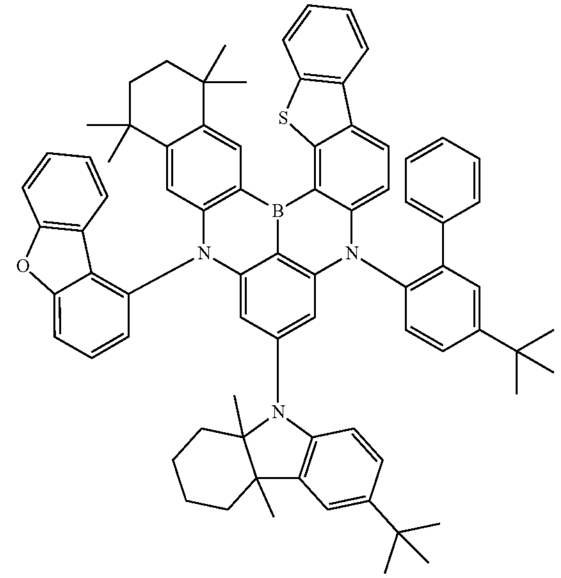
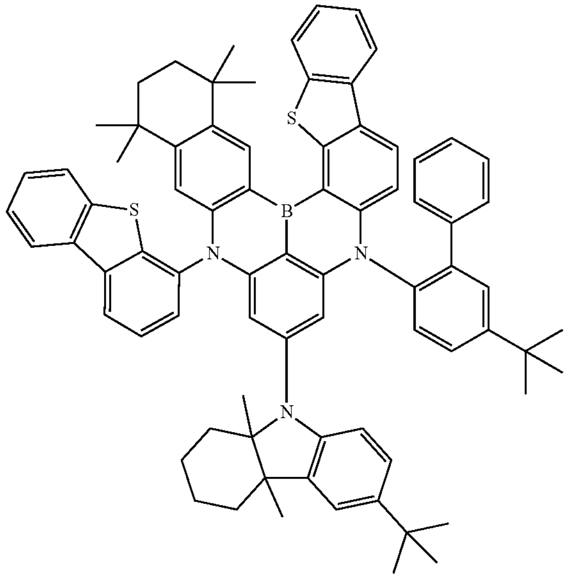
-continued -continued
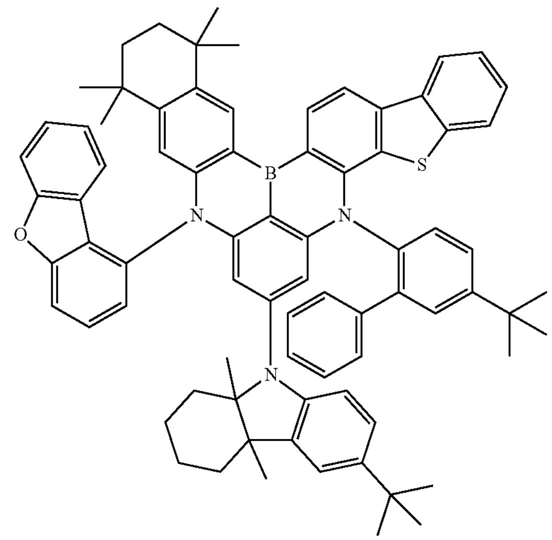
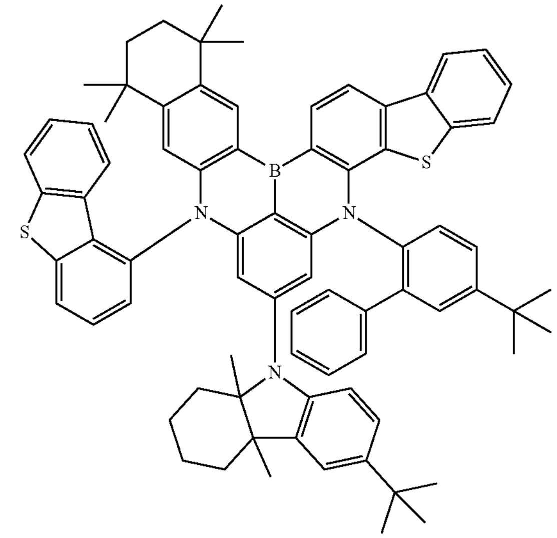
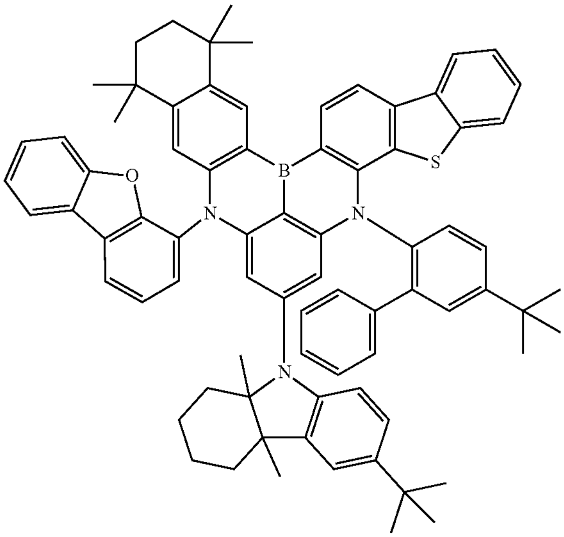
-continued
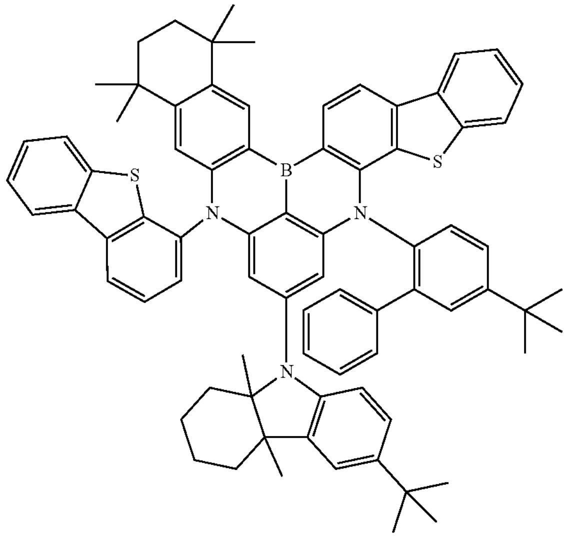
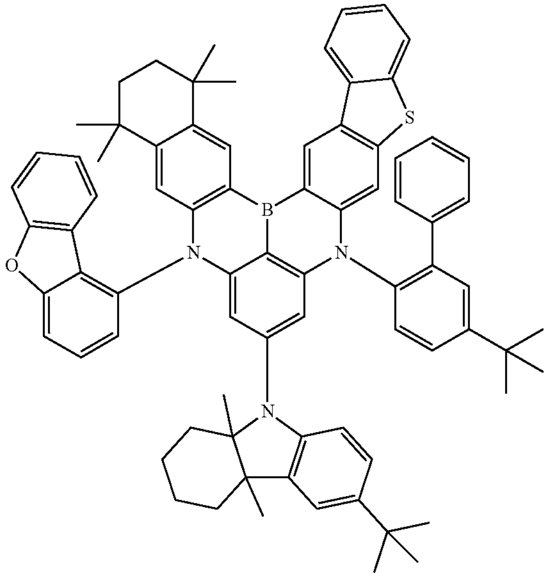
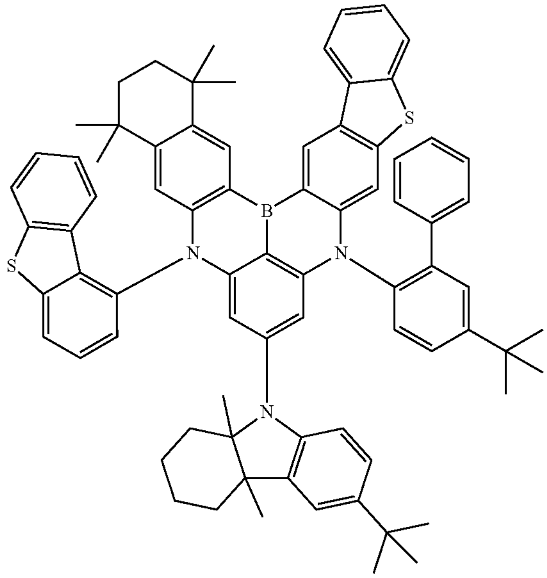

-continued
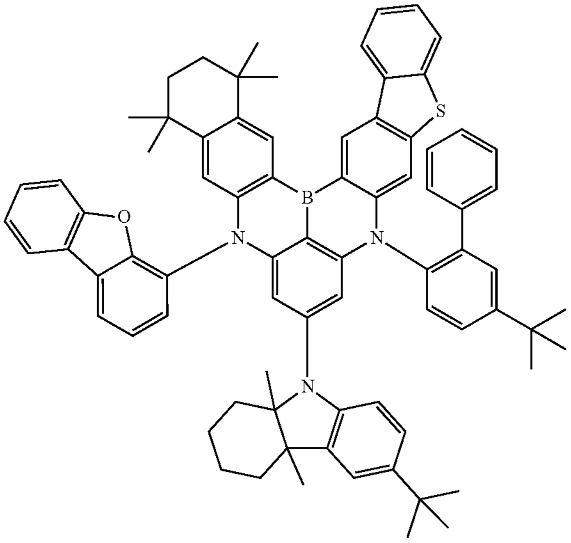
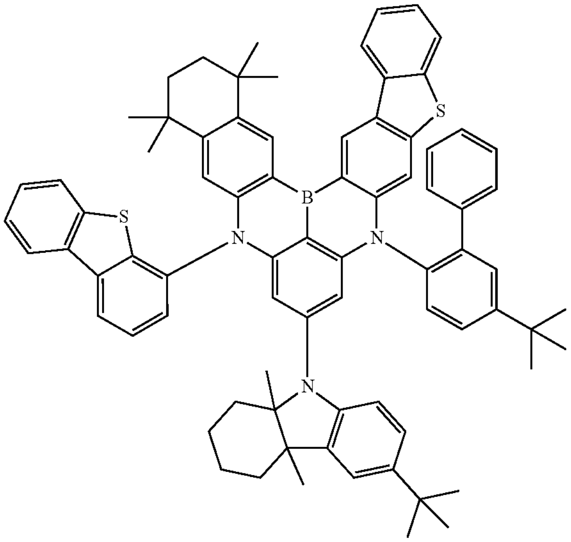
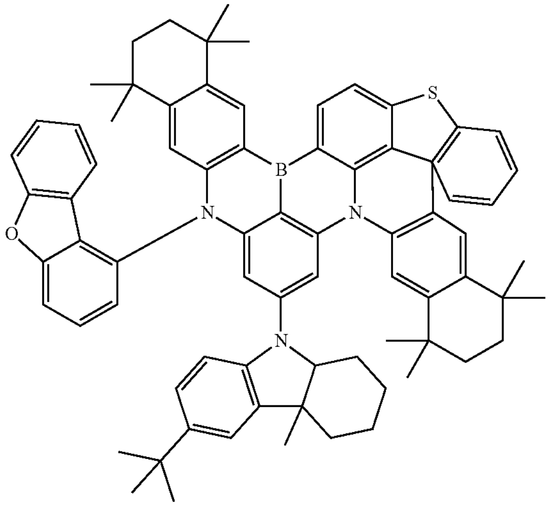
-continued
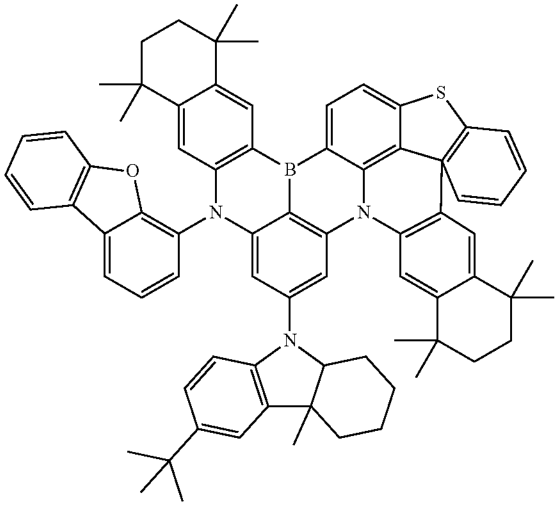
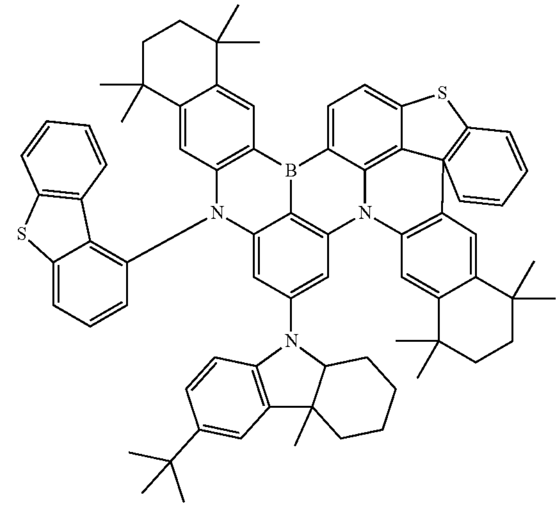
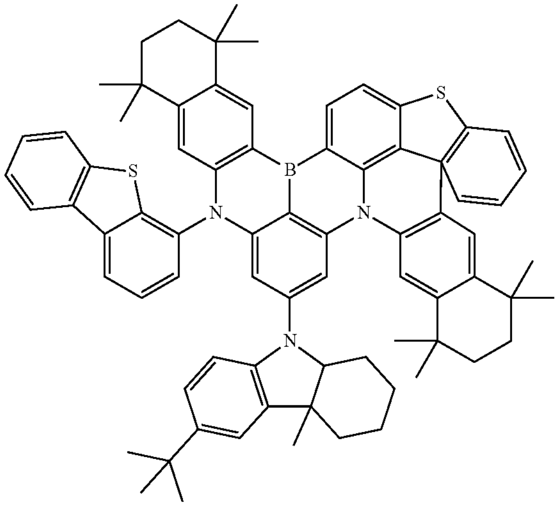

-continued
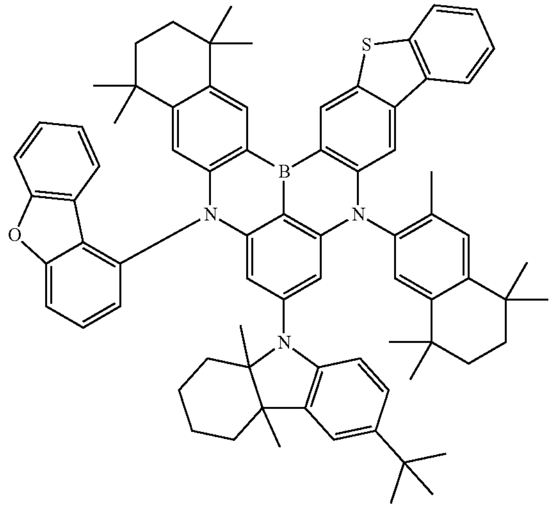
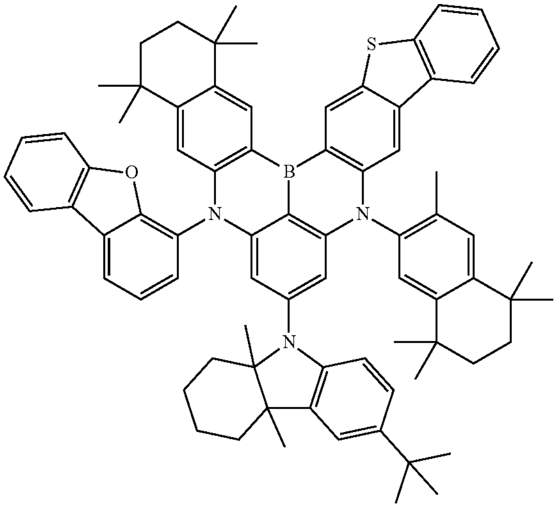
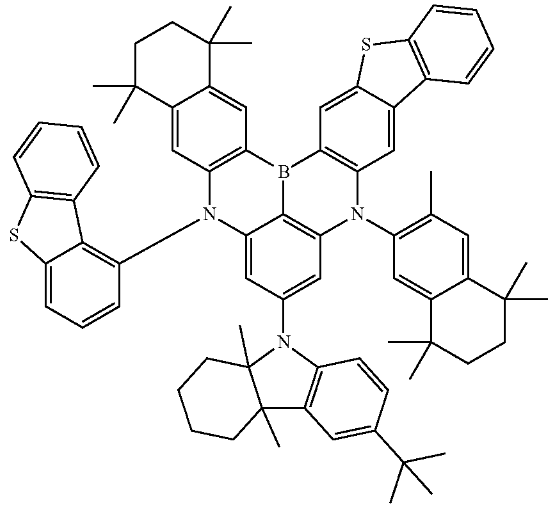
-continued
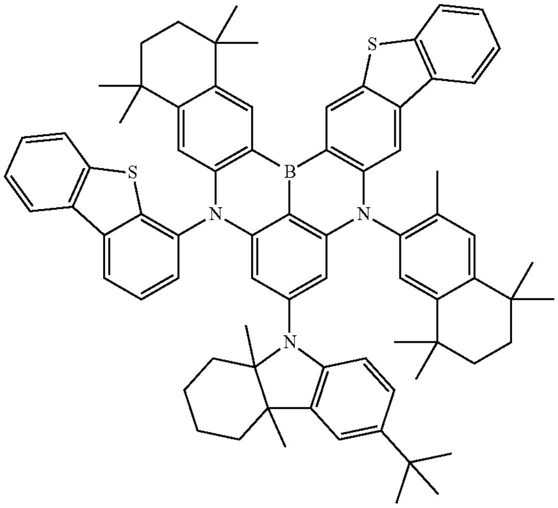
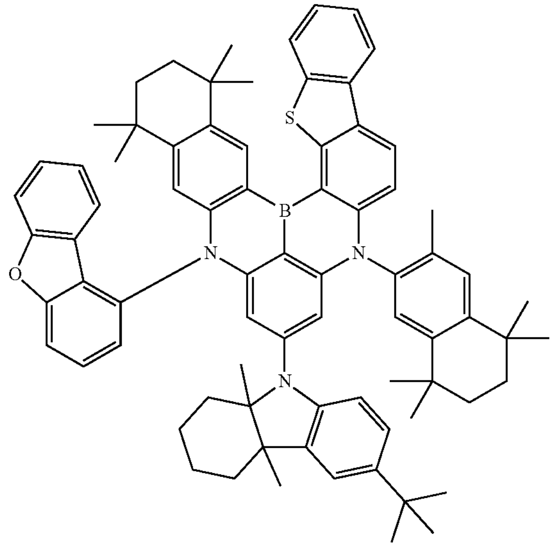
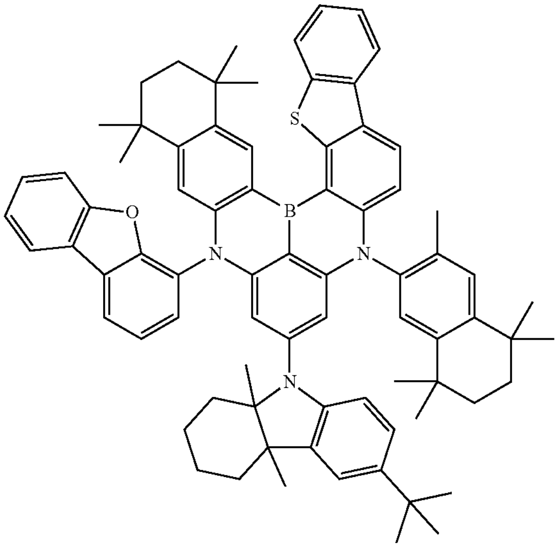

-continued
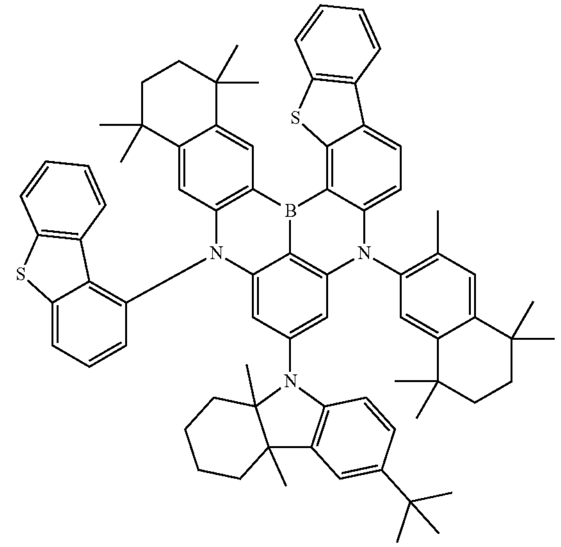
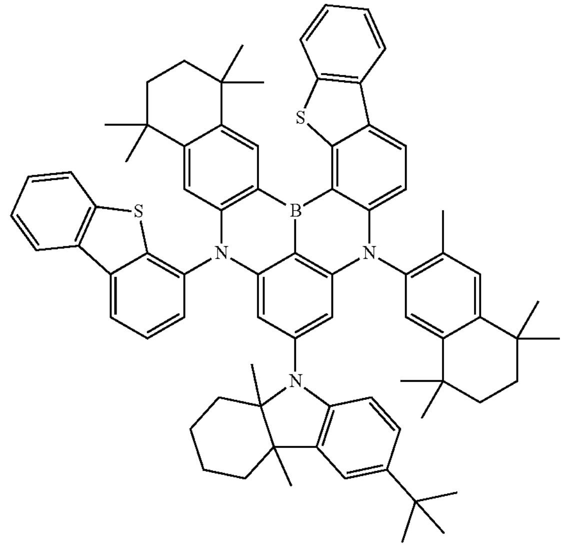
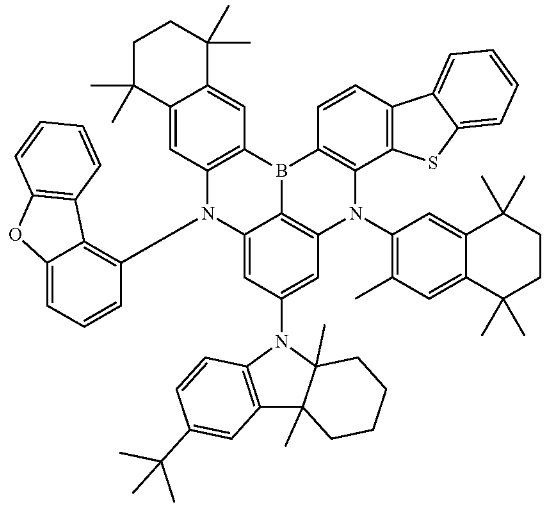
-continued
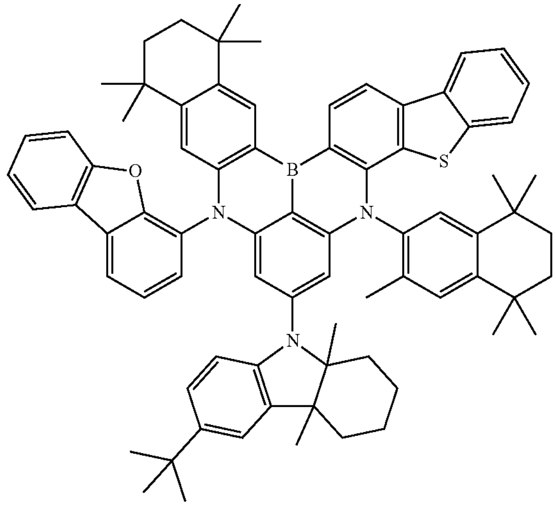
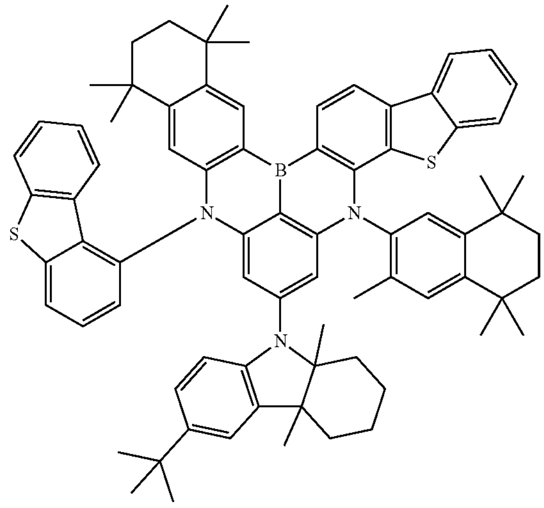
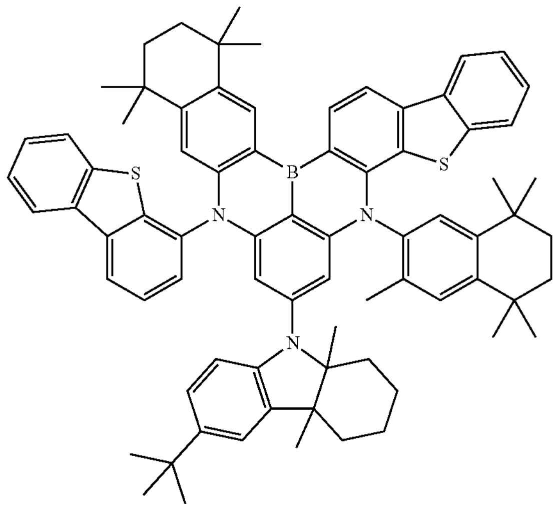

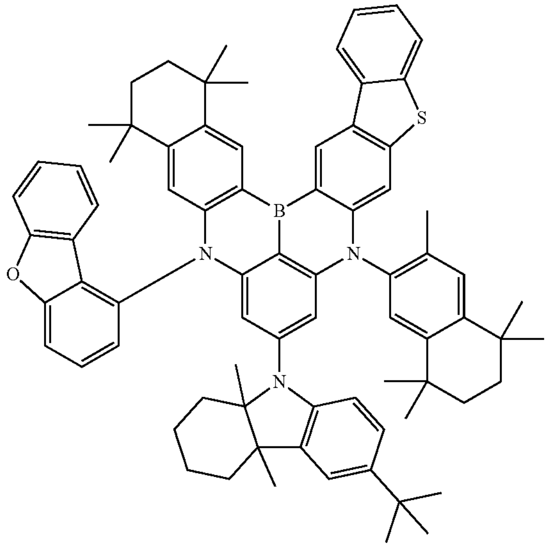
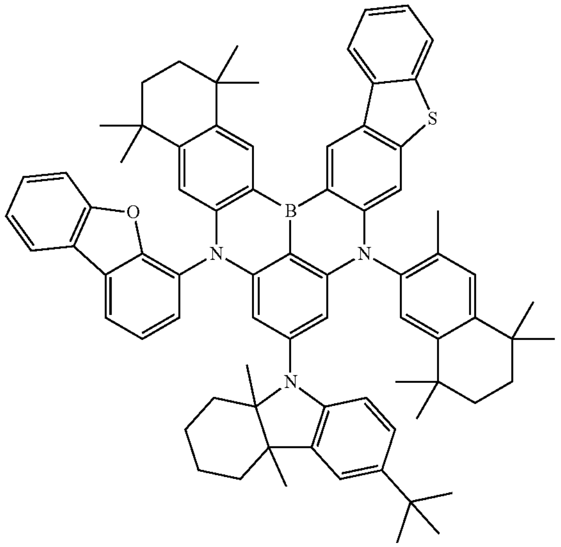
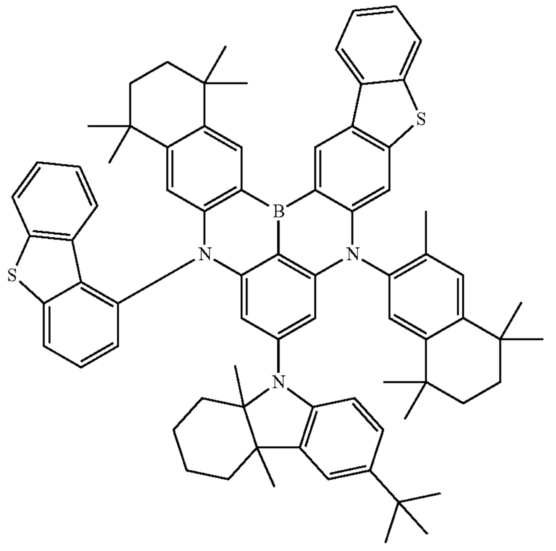
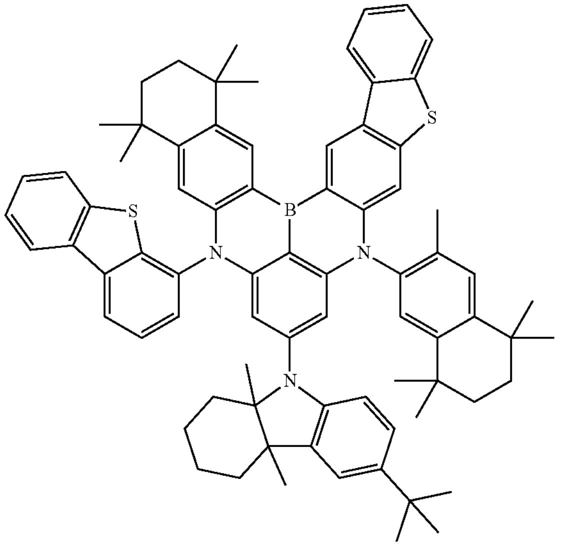
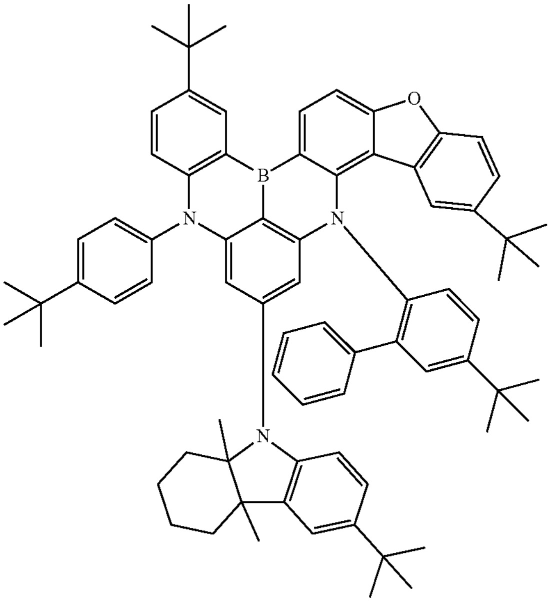
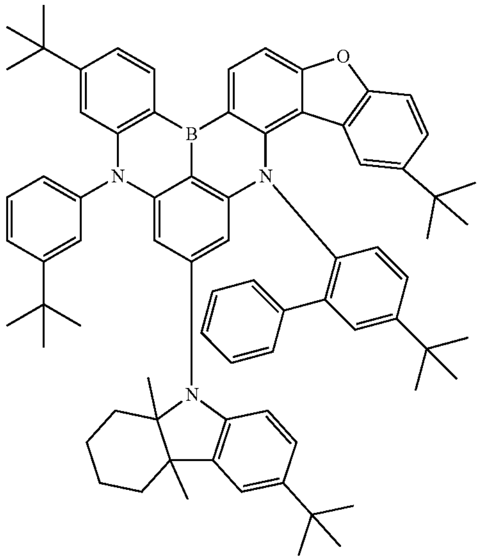

-continued
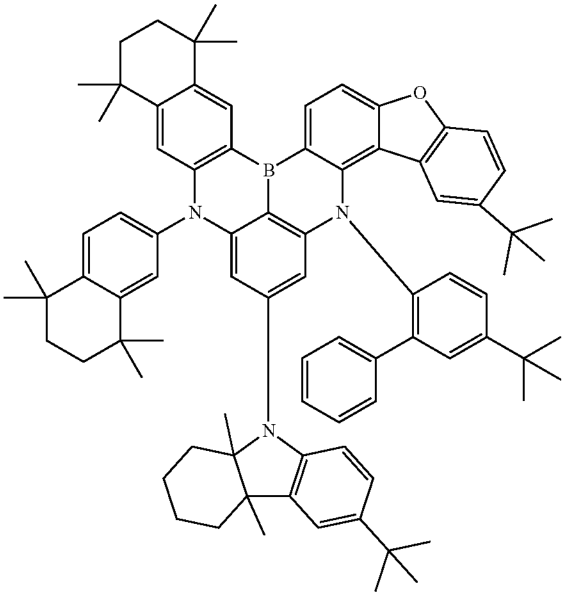
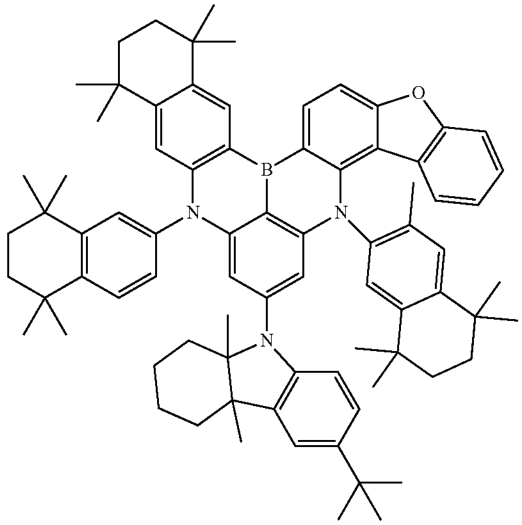
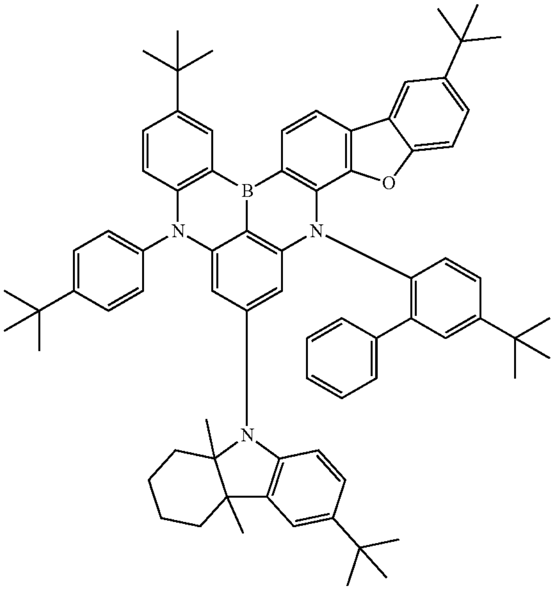
-continued
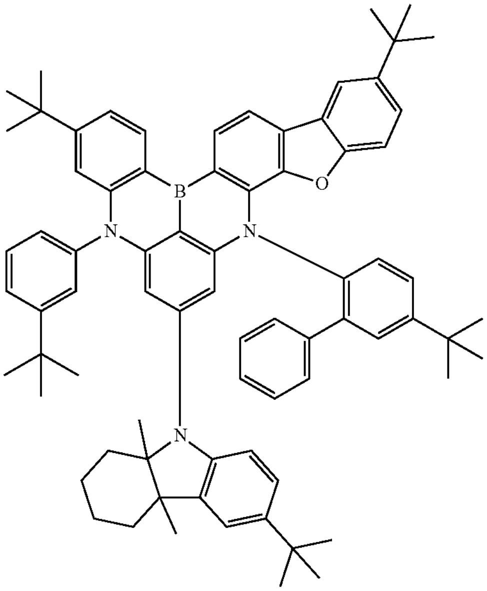
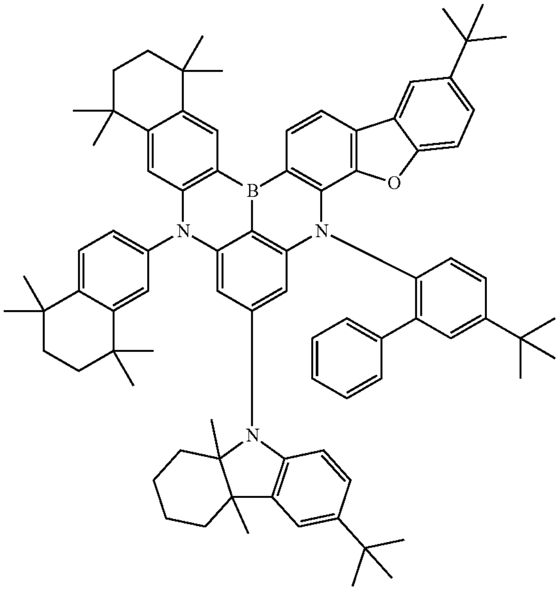
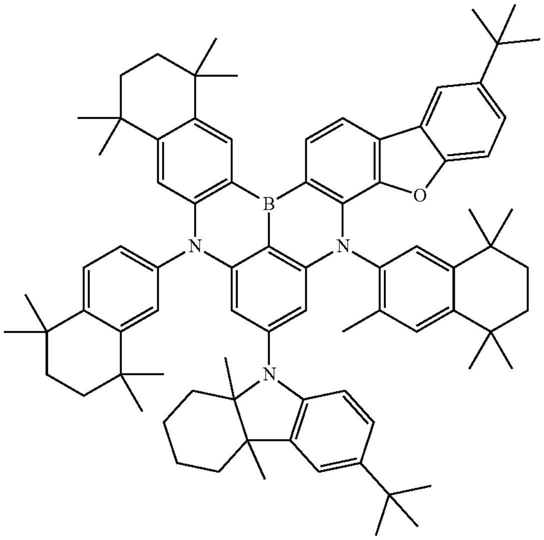

-continued
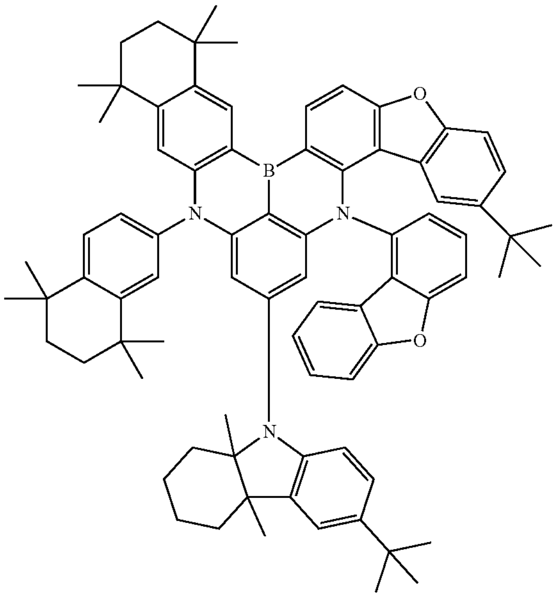
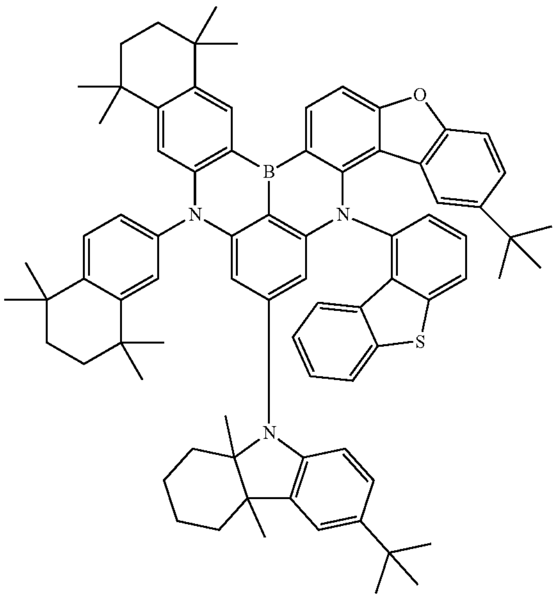
-continued
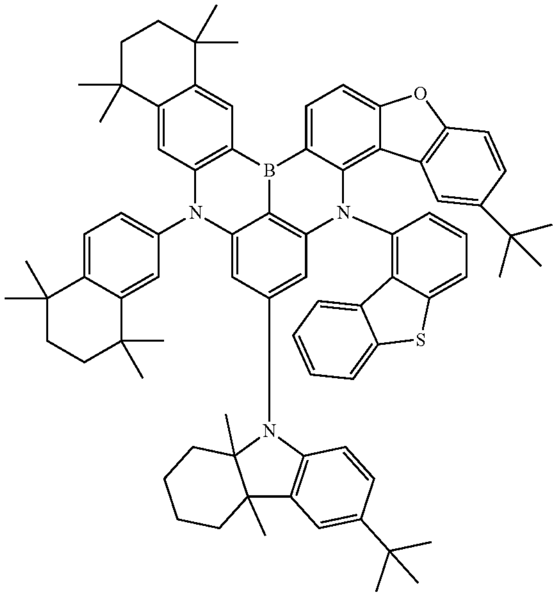
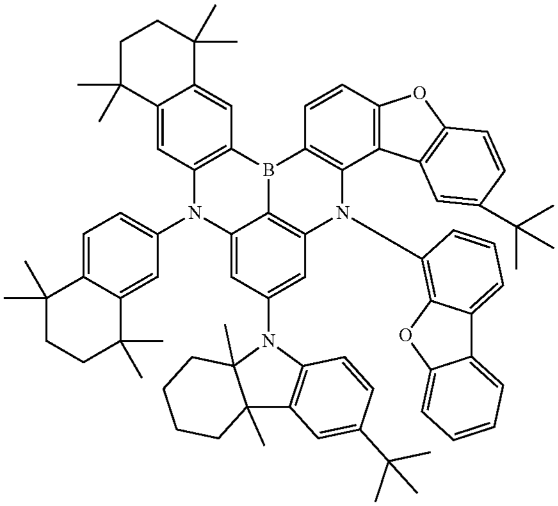
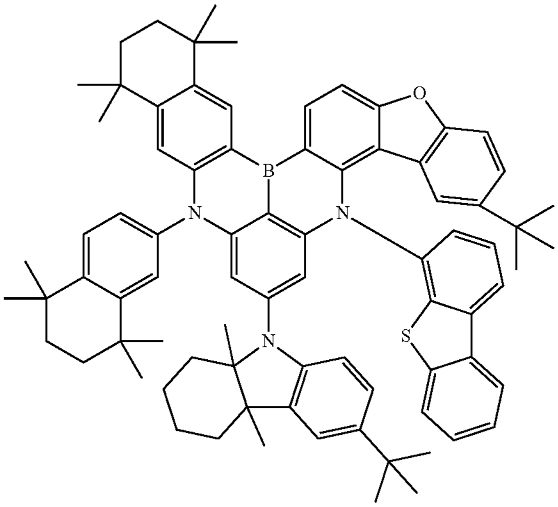

-continued
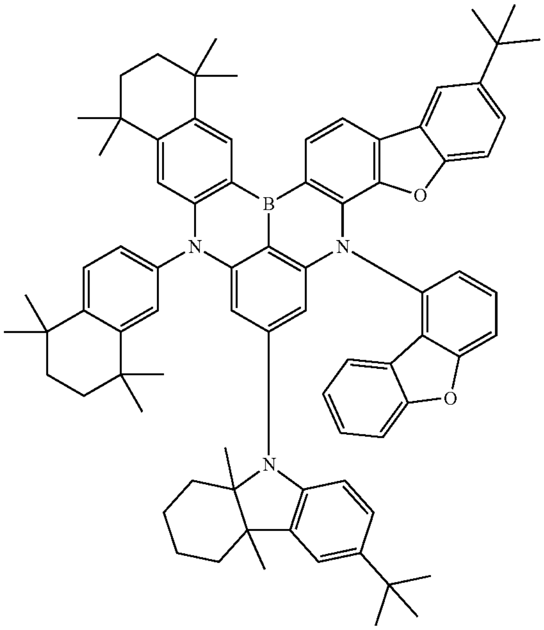
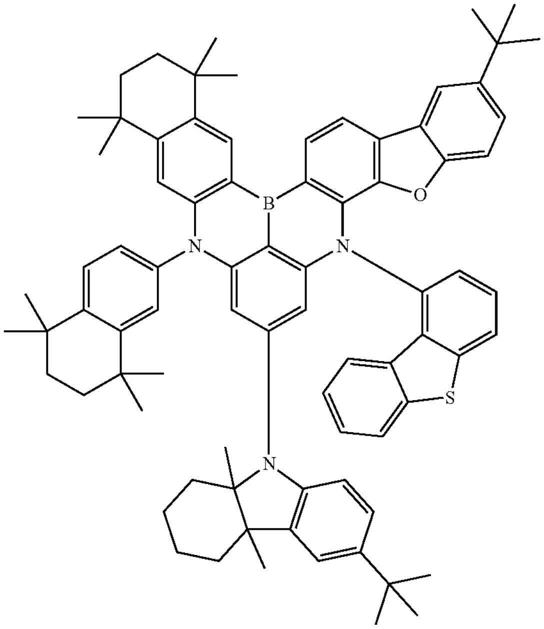
-continued
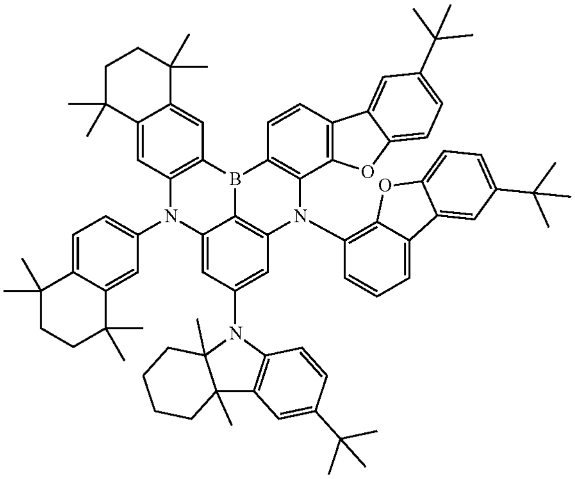
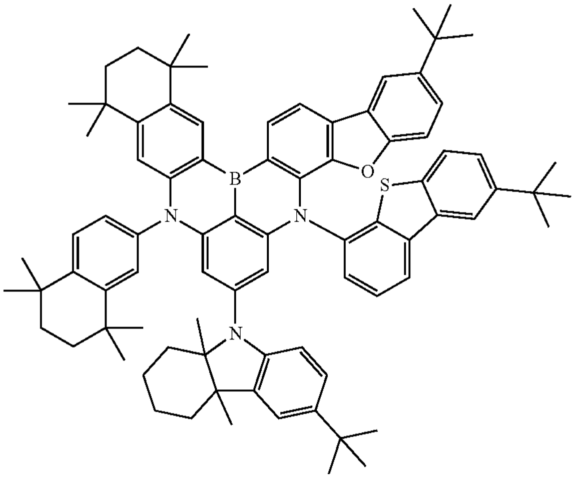
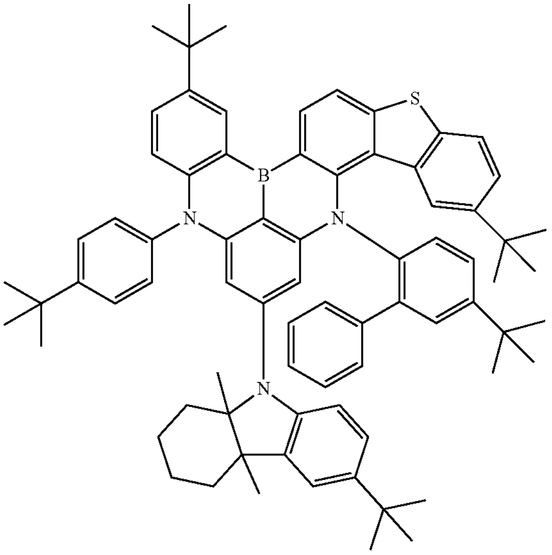

-continued
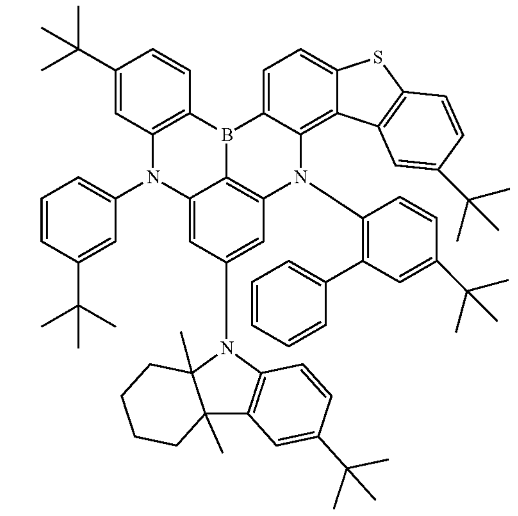
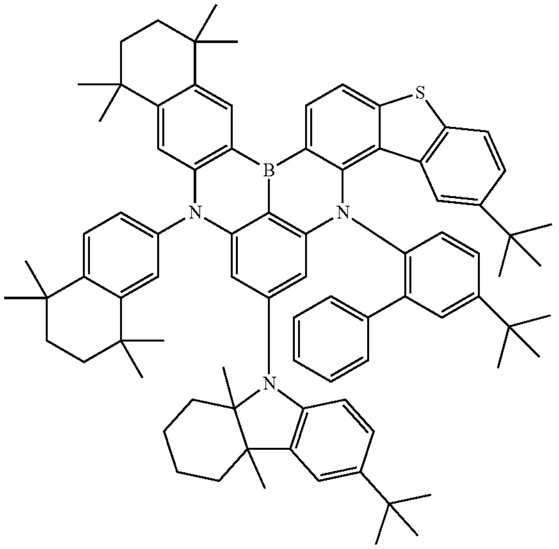
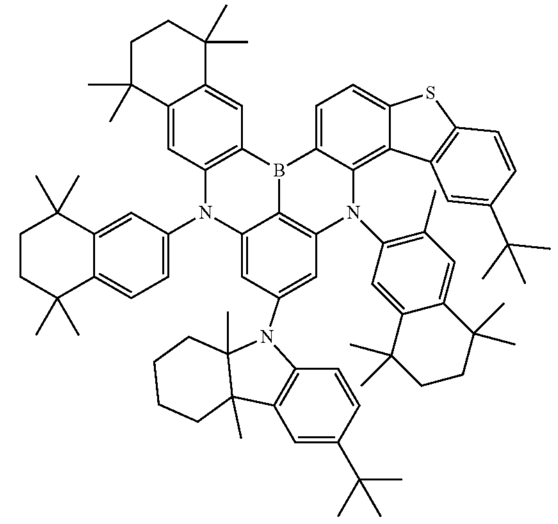
-continued
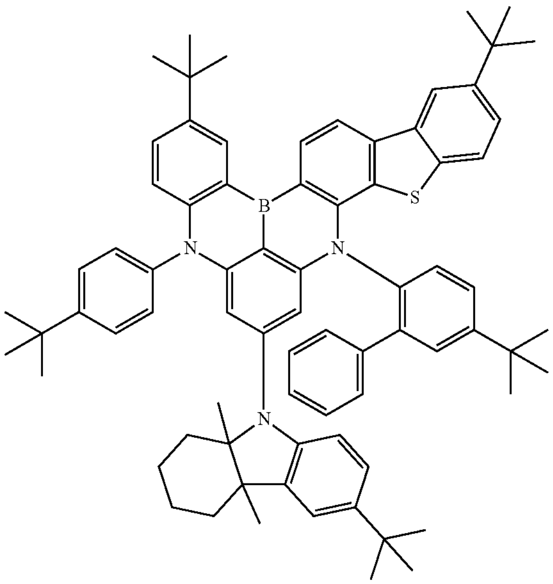
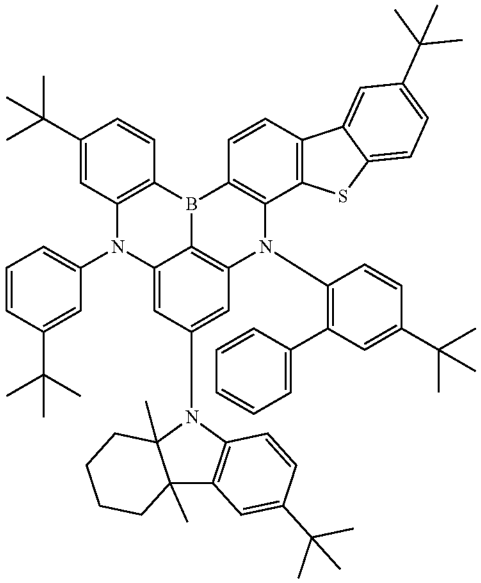

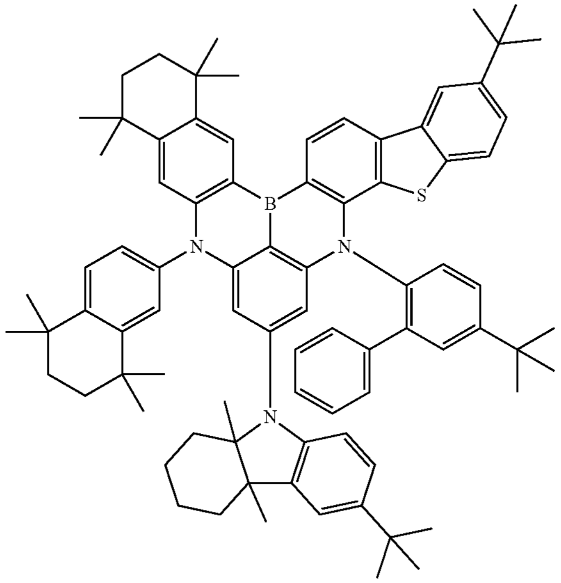
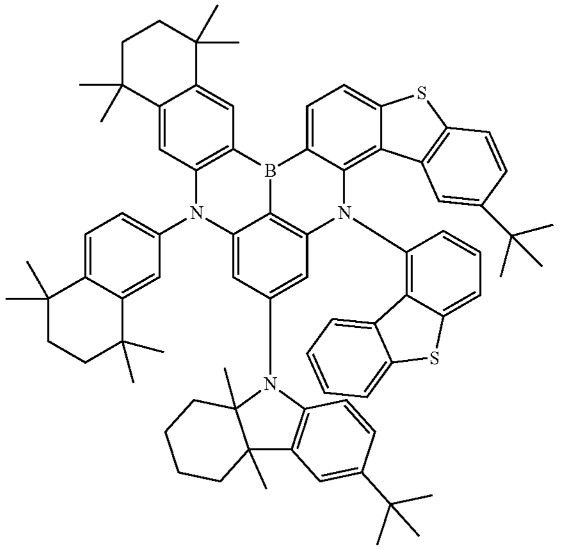
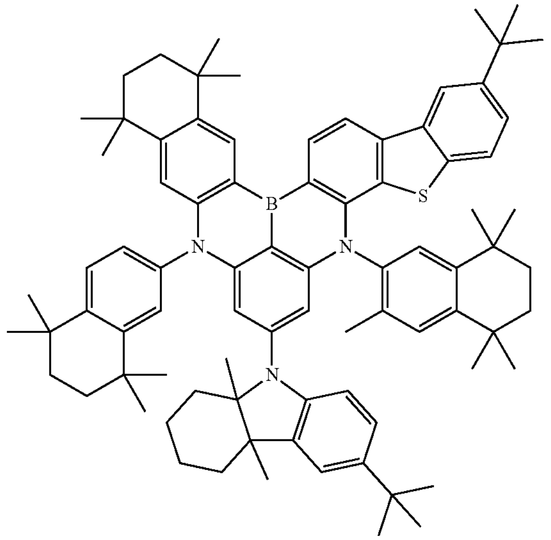
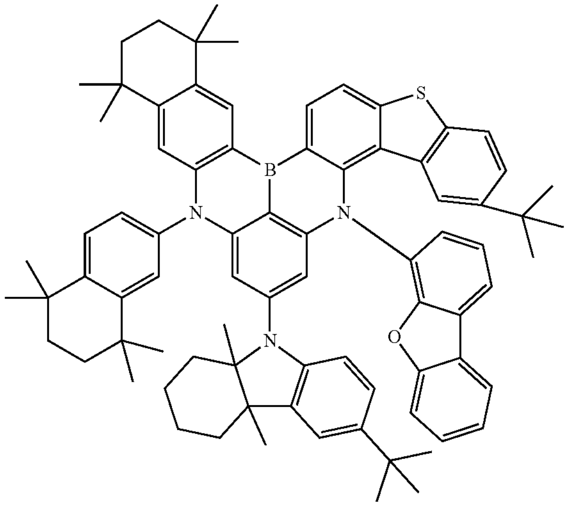
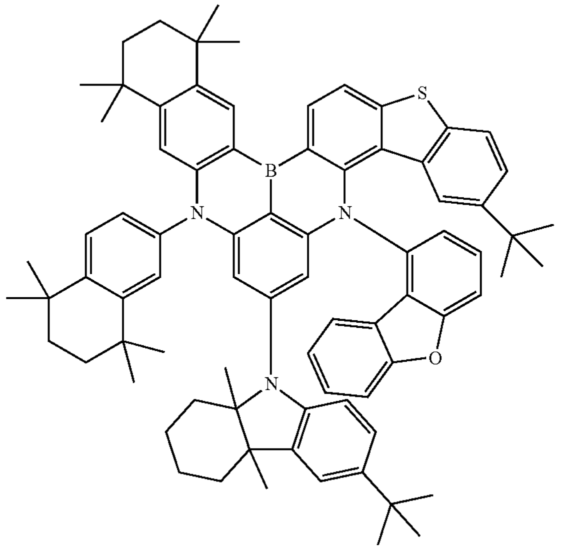
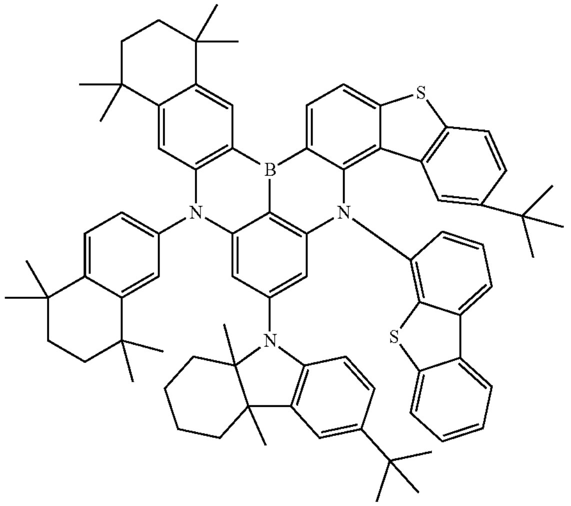

-continued
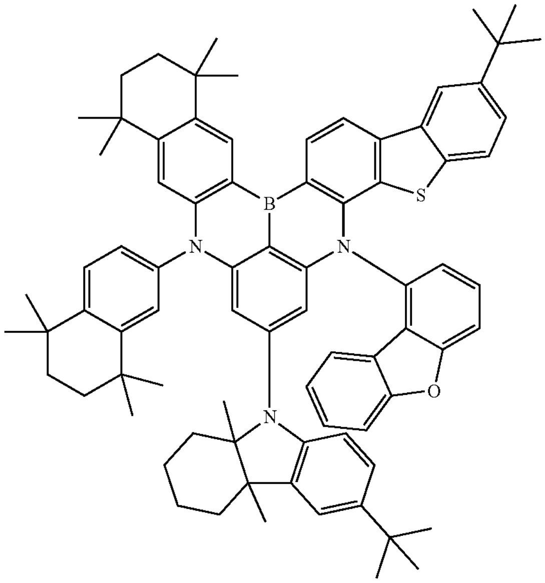
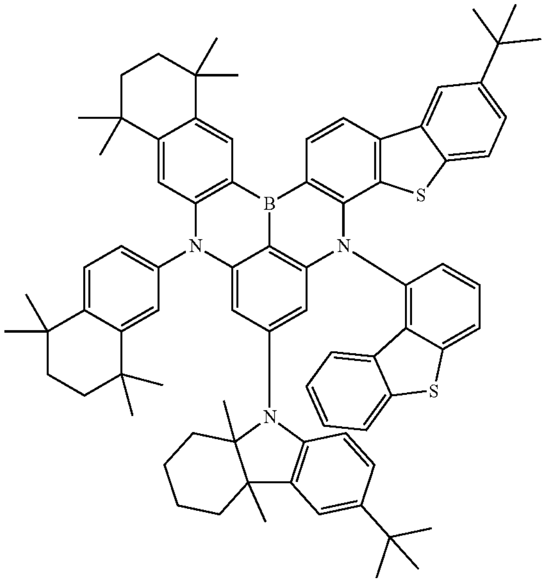
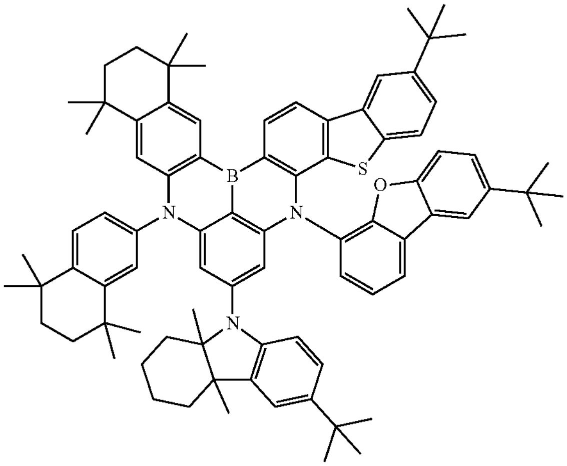
-continued
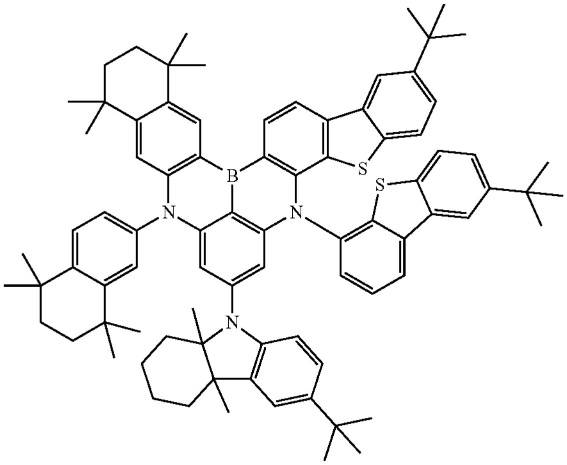
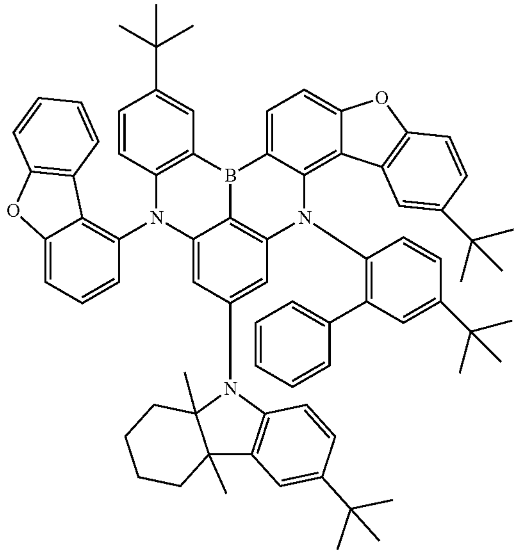
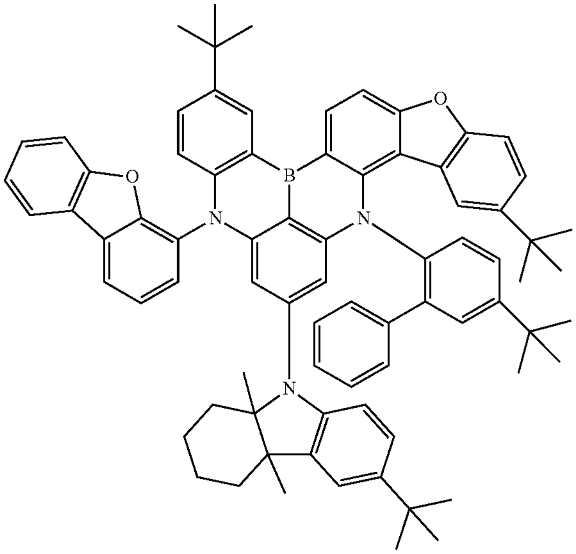

-continued
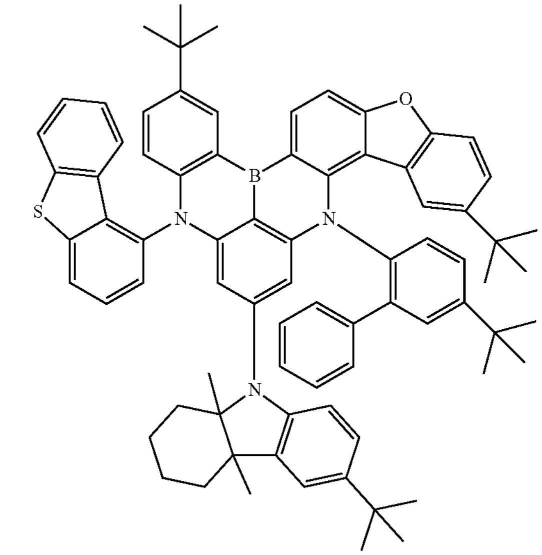
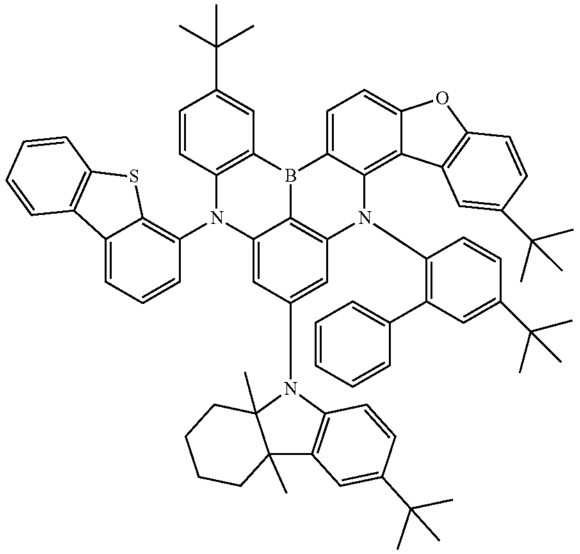
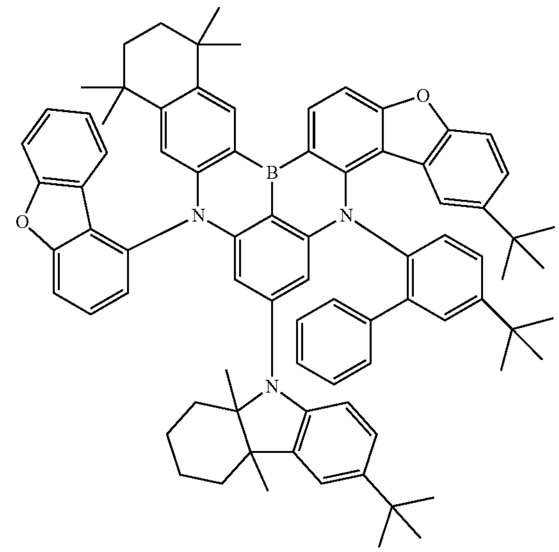
-continued
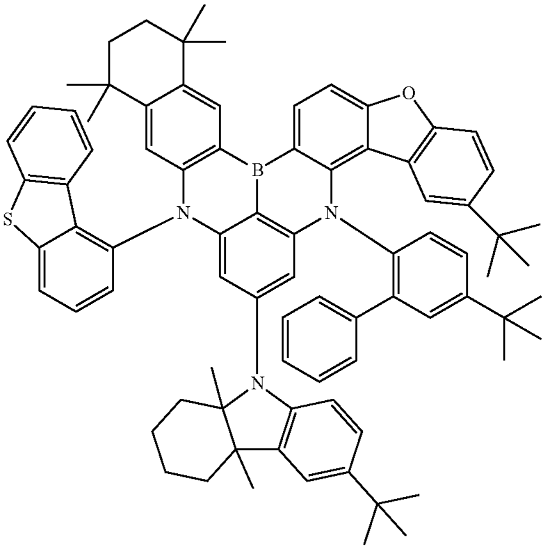
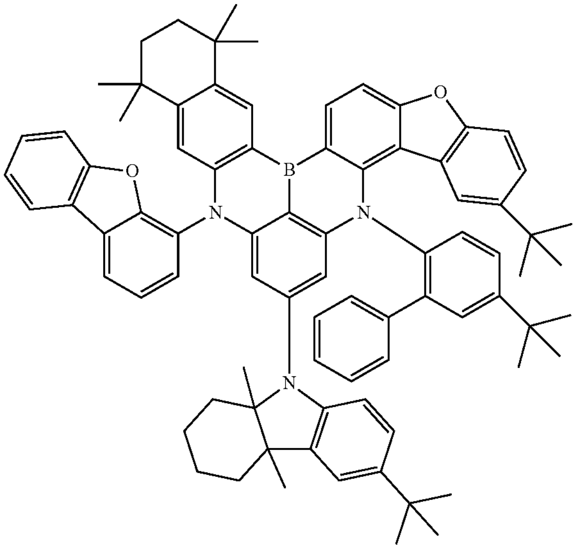
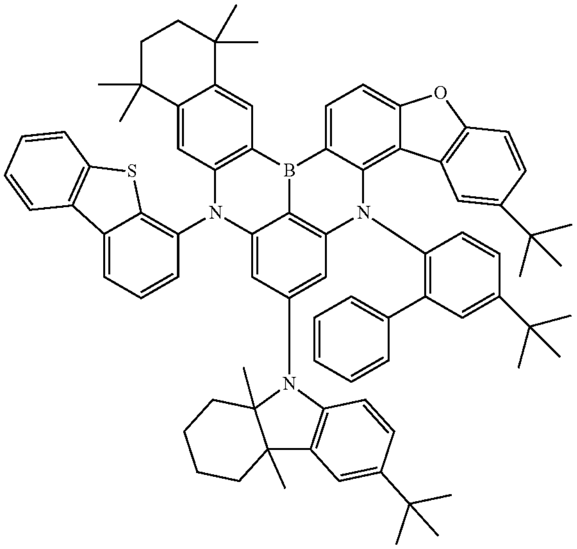

-continued
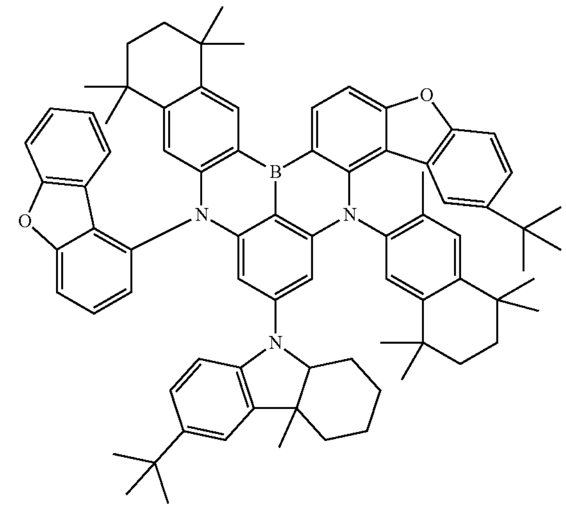
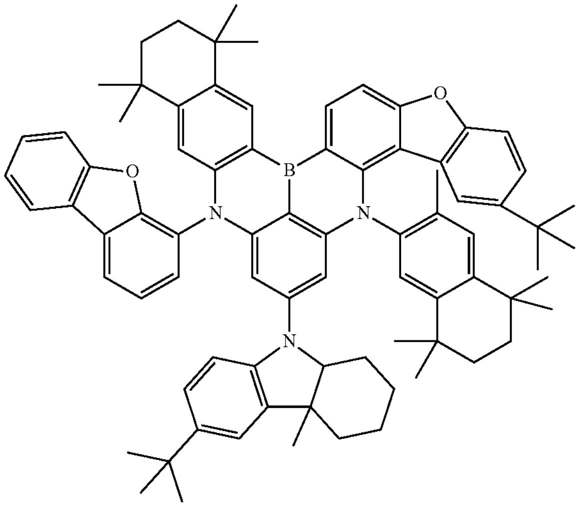
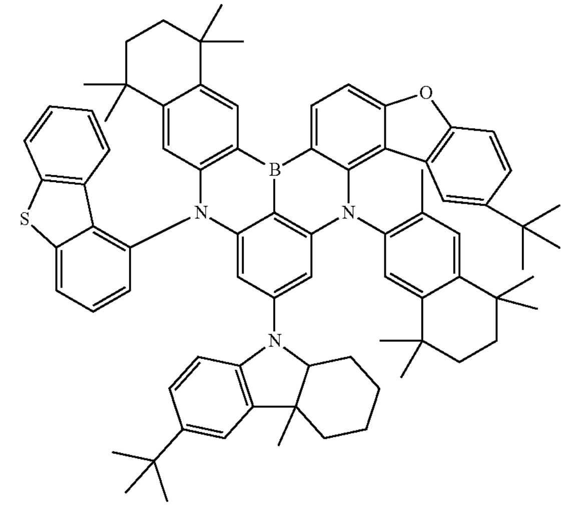
-continued
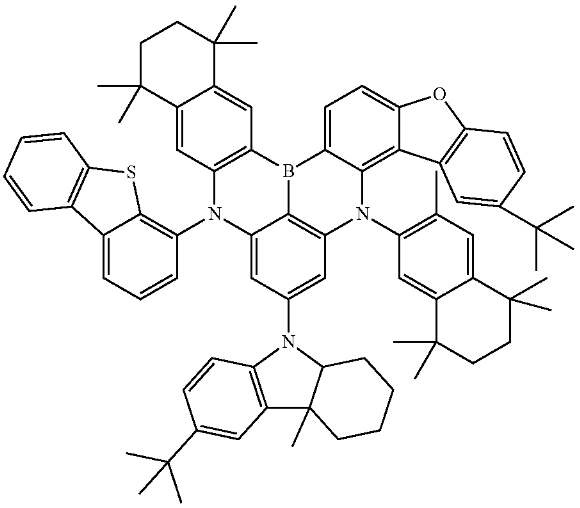
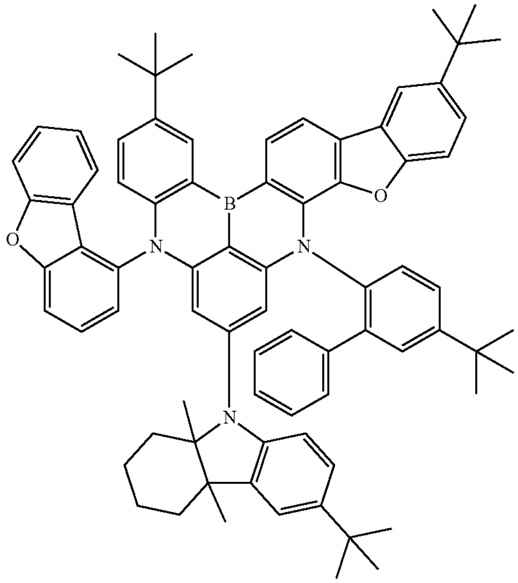
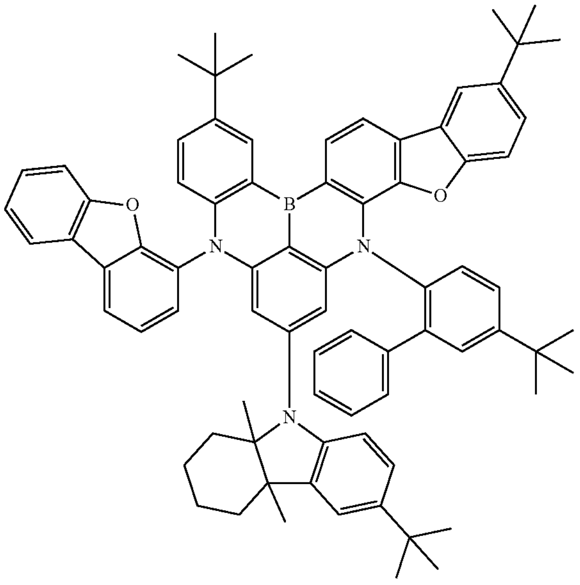

-continued
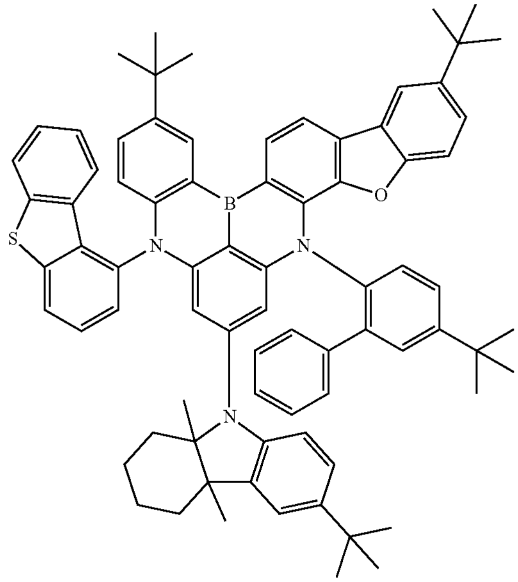
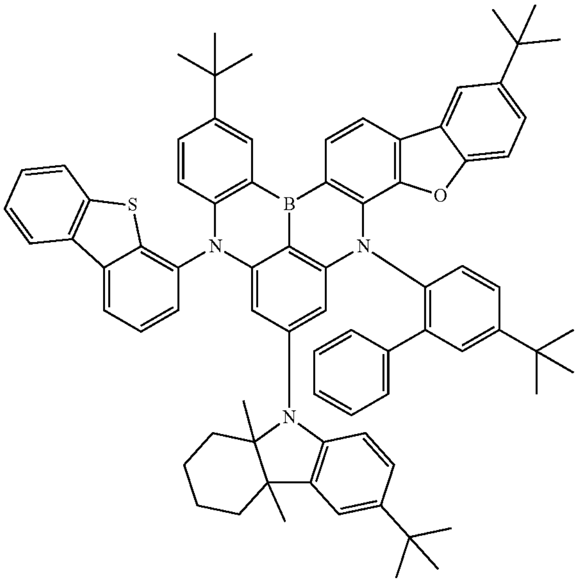
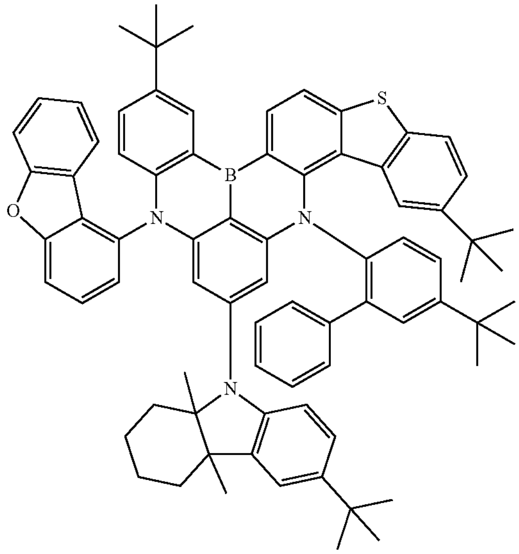
-continued
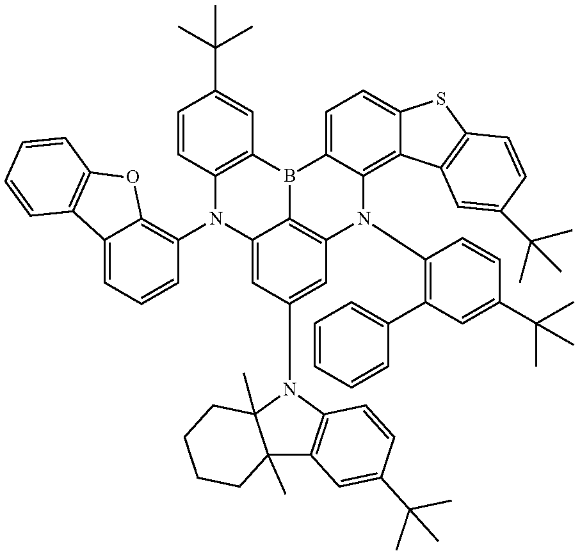
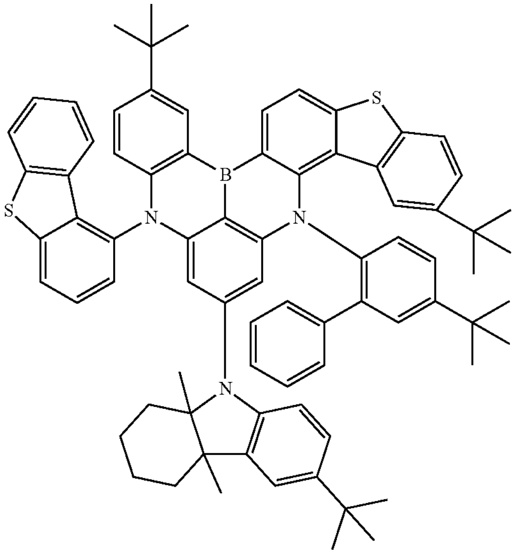
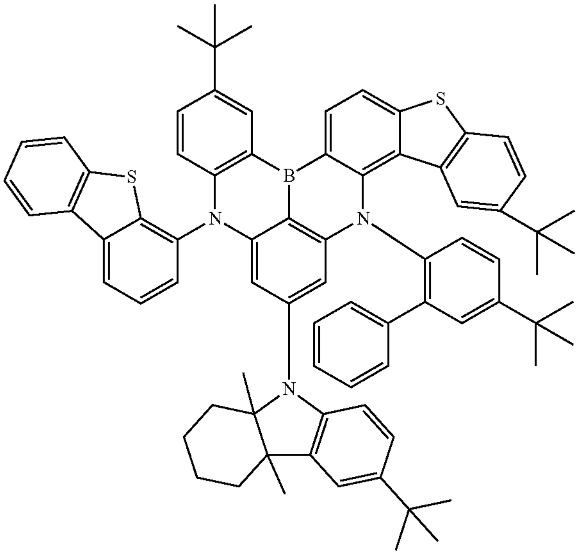

-continued
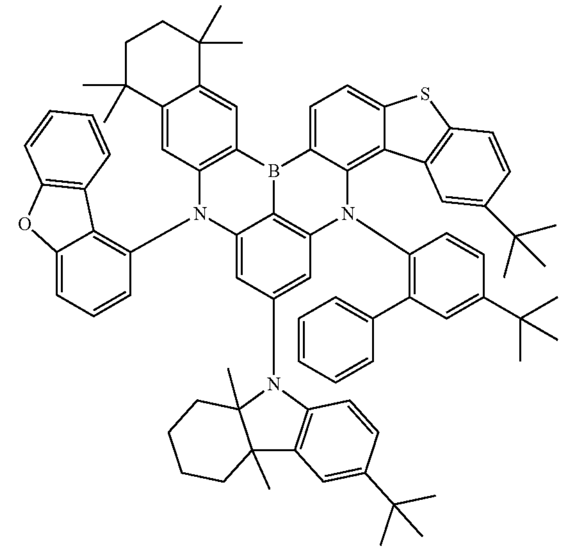
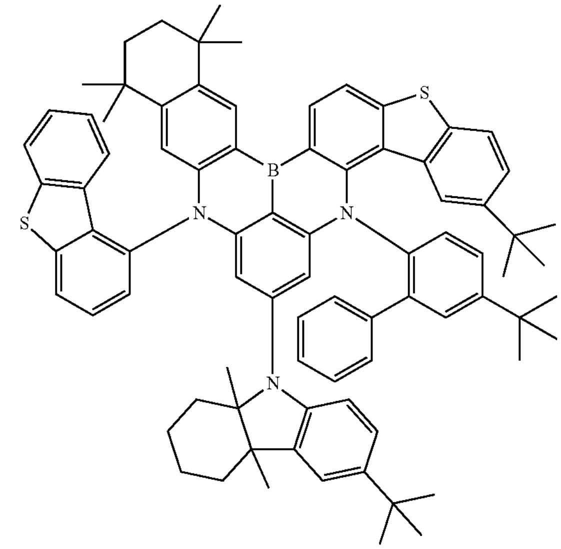
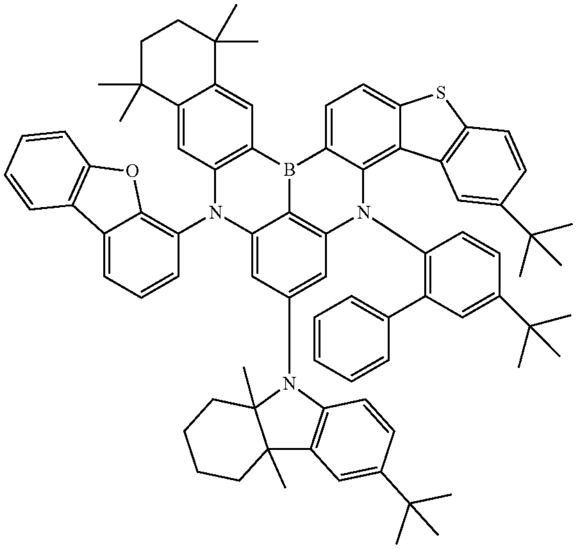
-continued
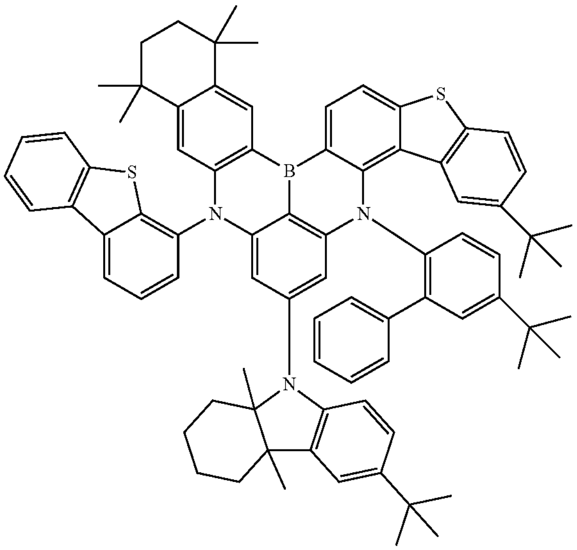
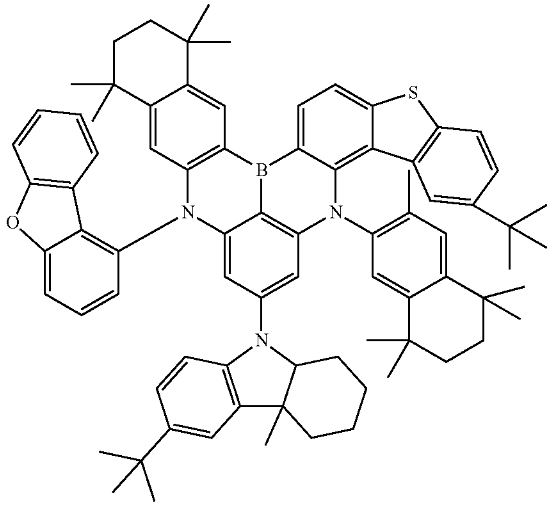
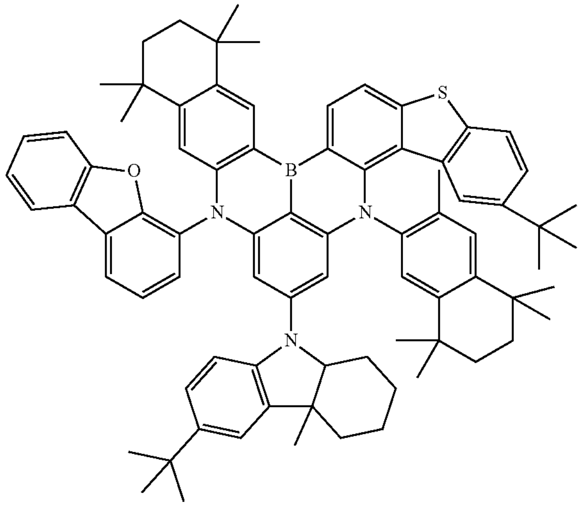

-continued
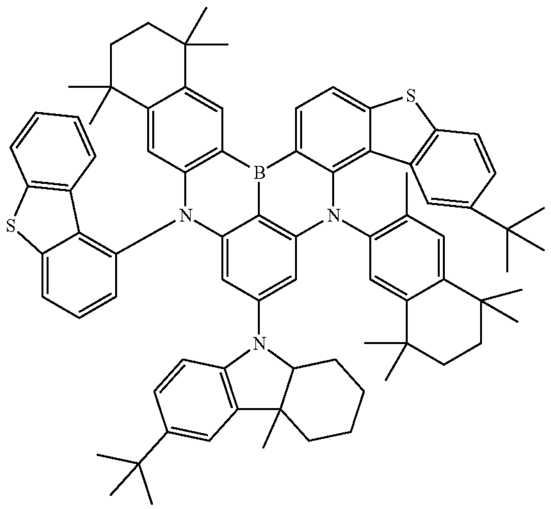
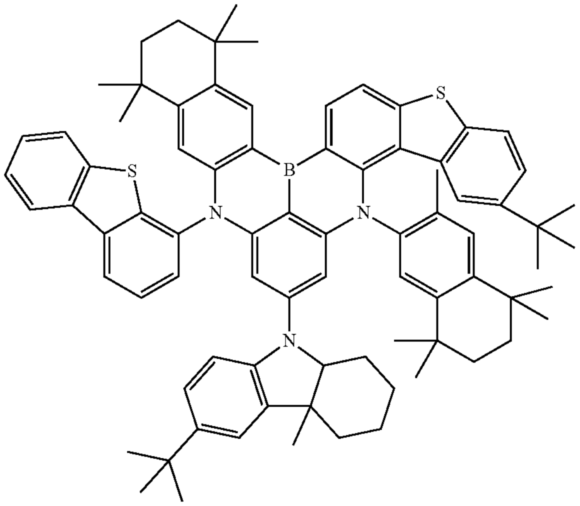
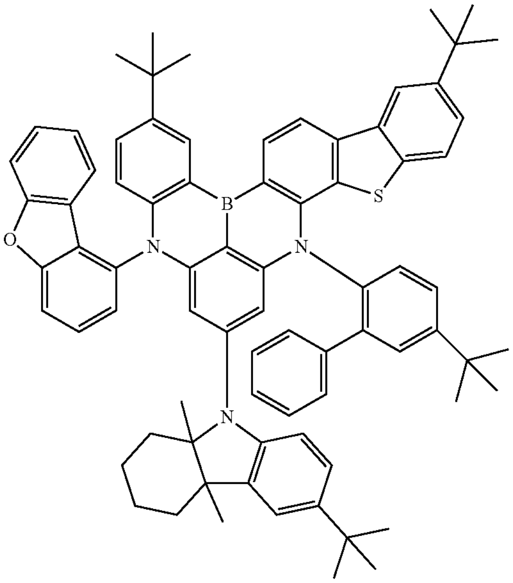
-continued
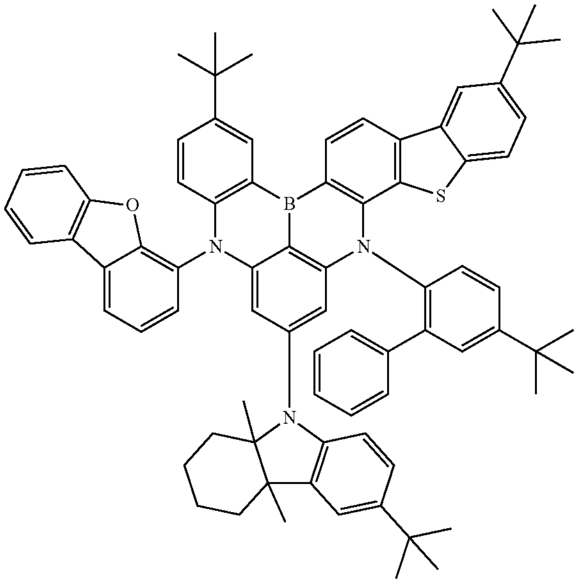
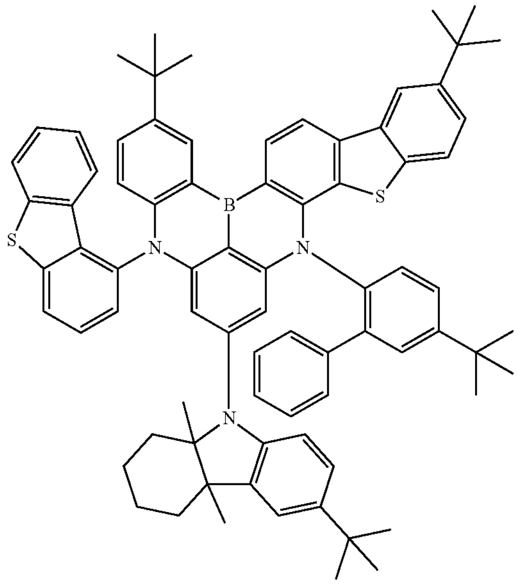

-continued
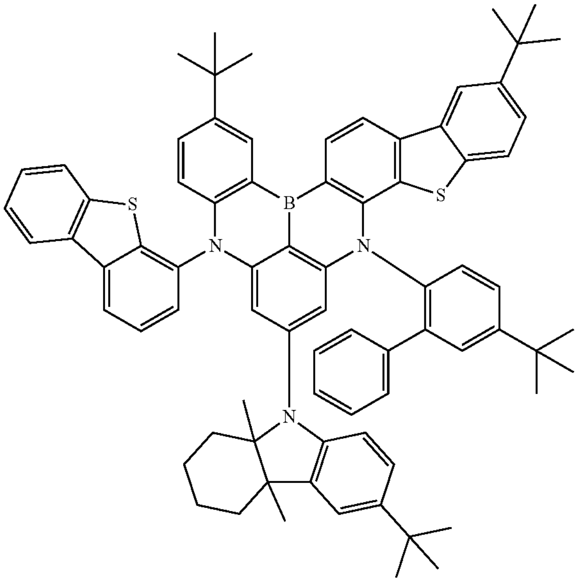
-continued
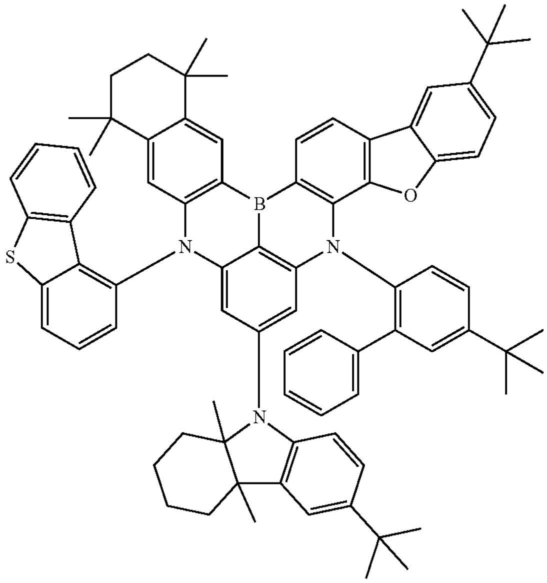
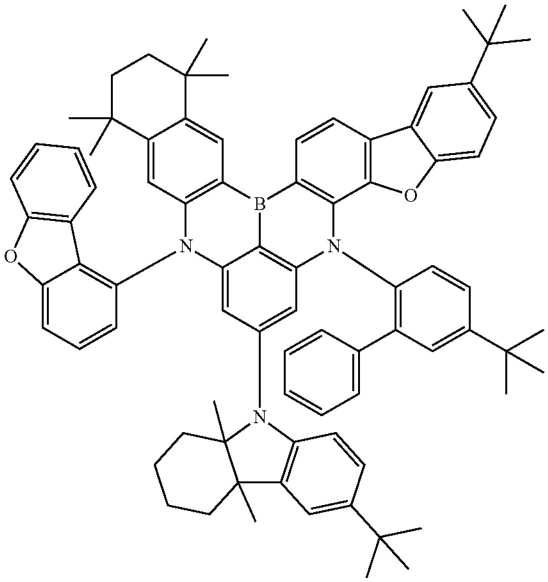
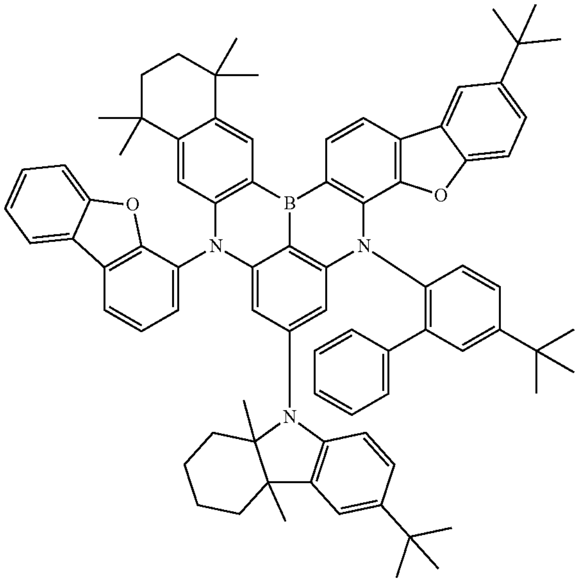

-continued
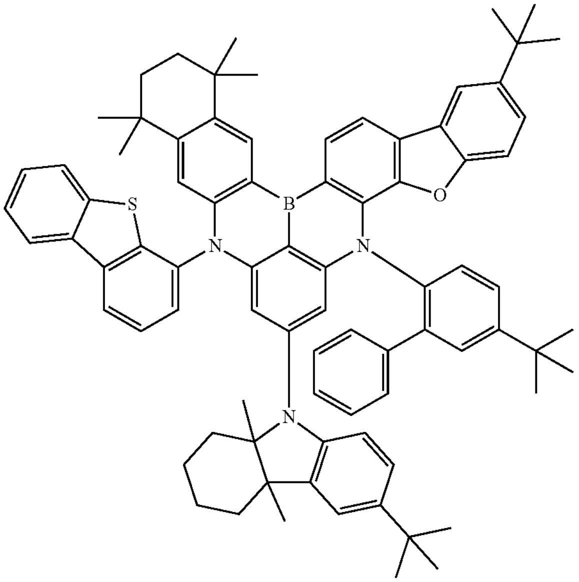
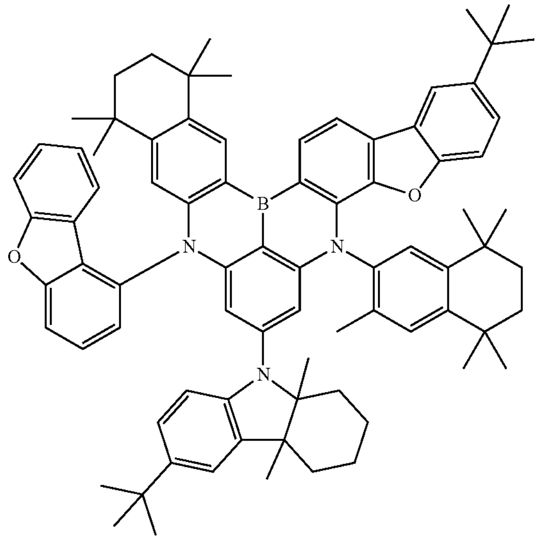
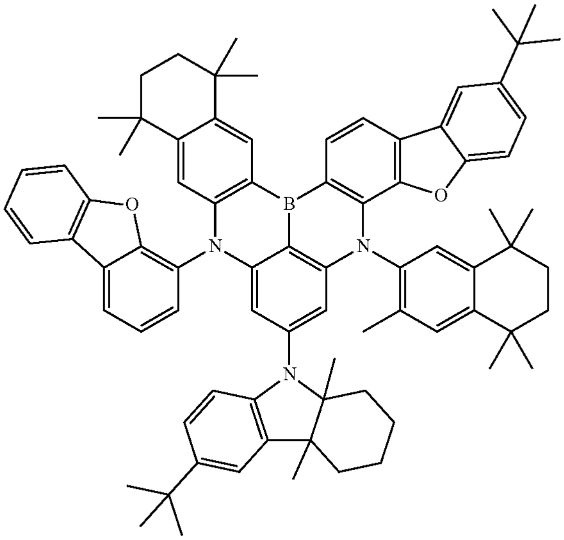
-continued
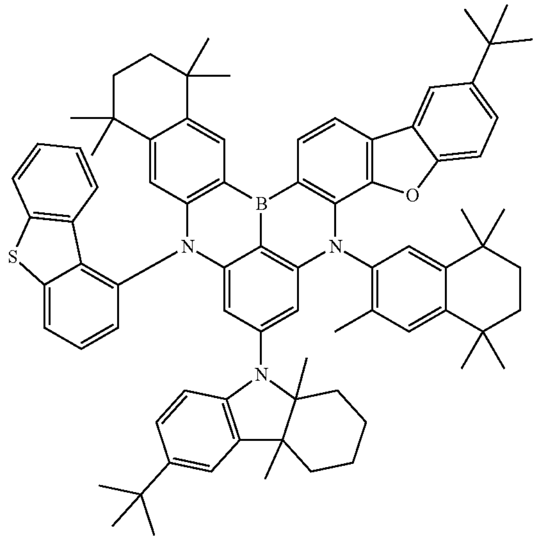
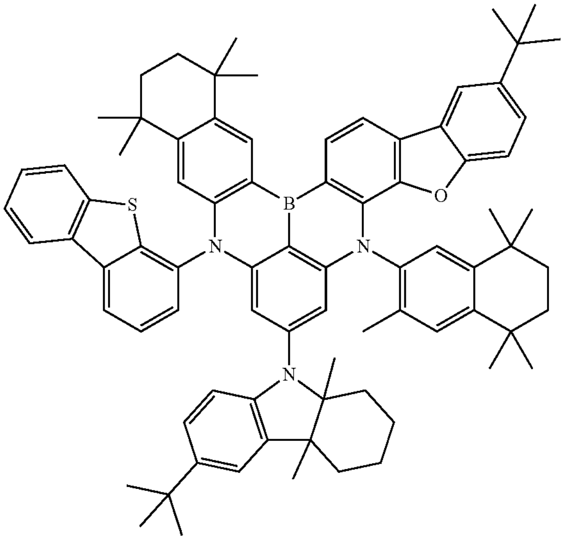
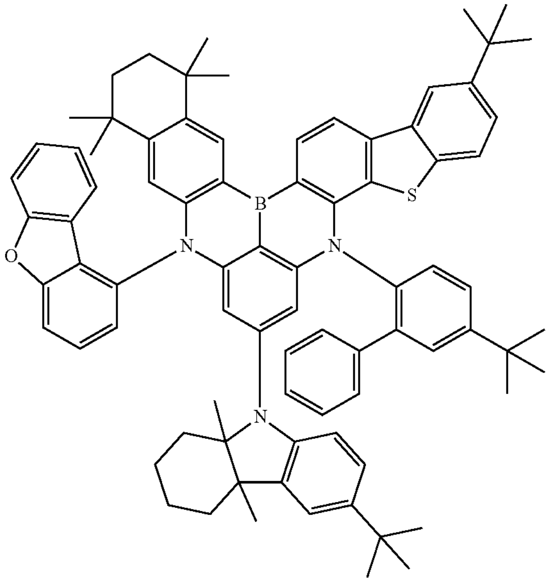

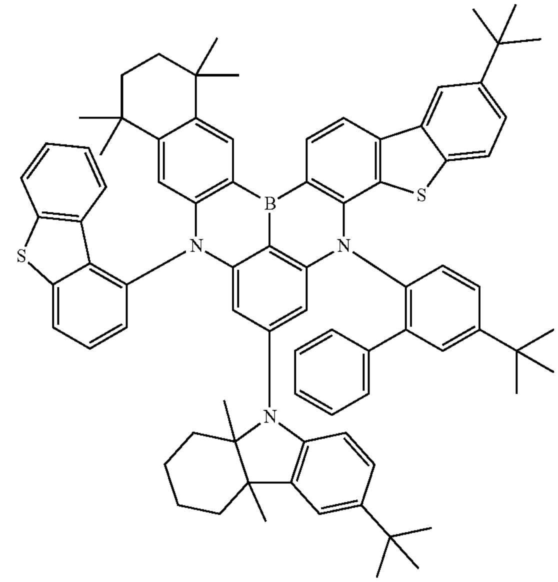
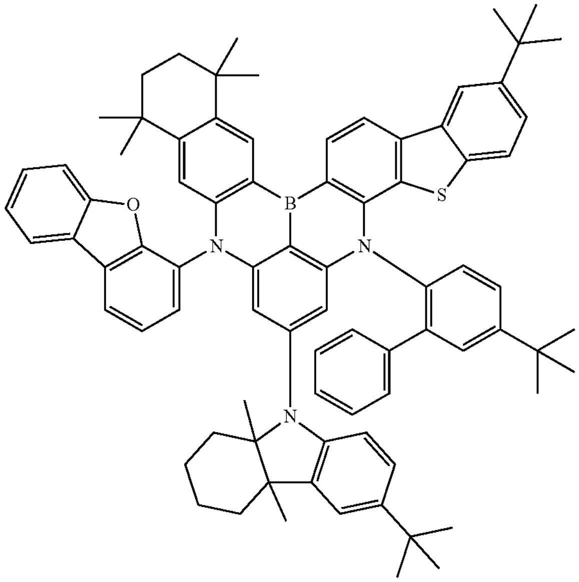
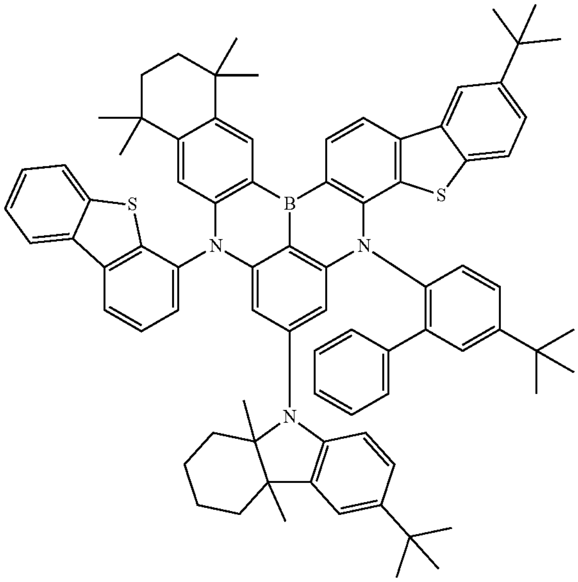
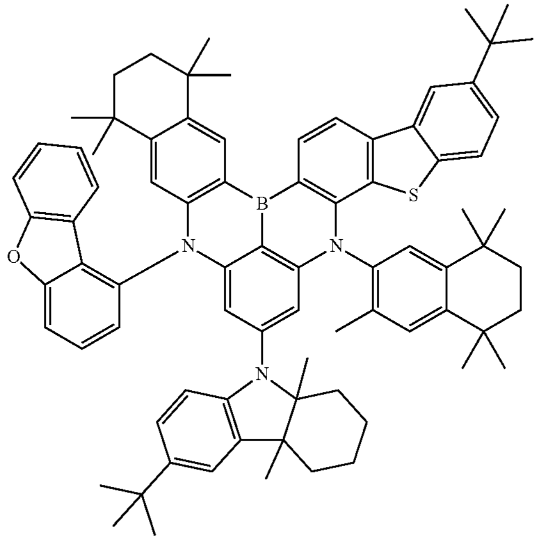
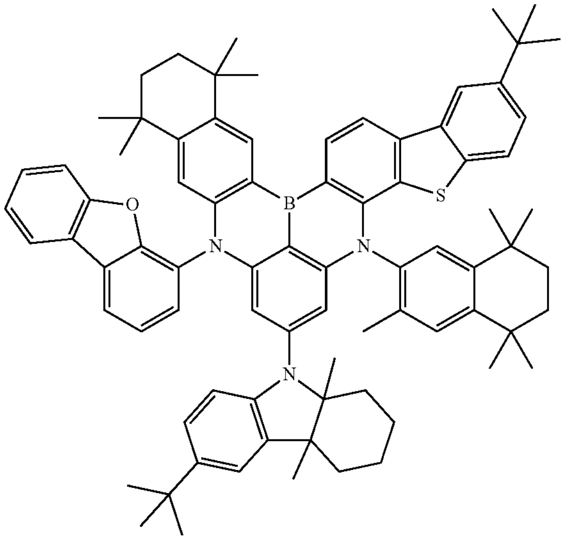

-continued
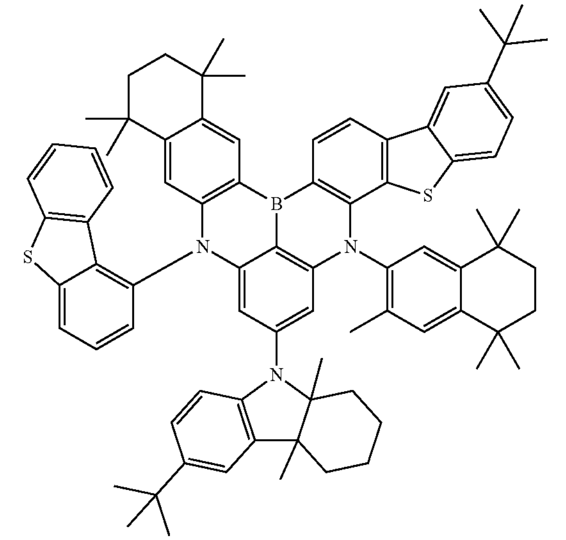
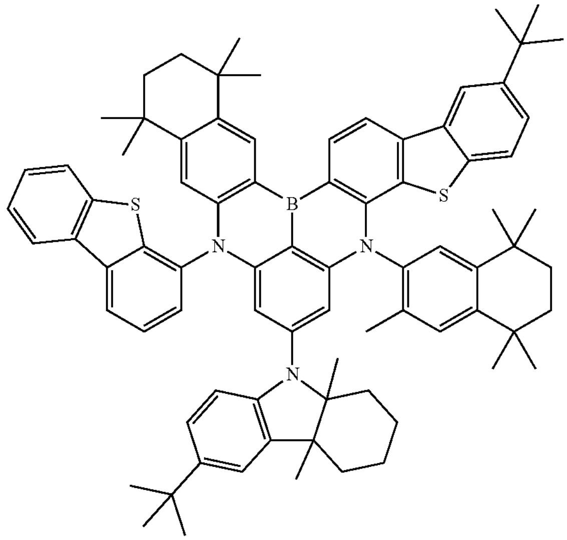
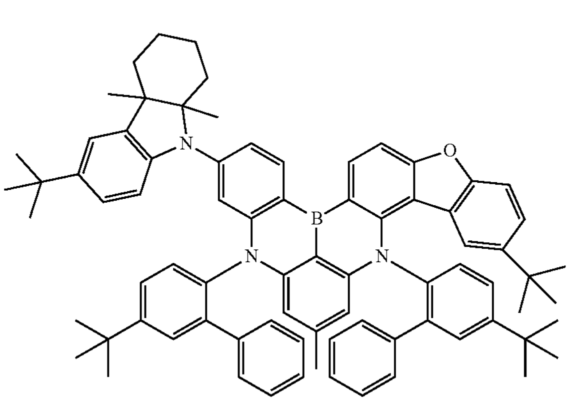
-continued
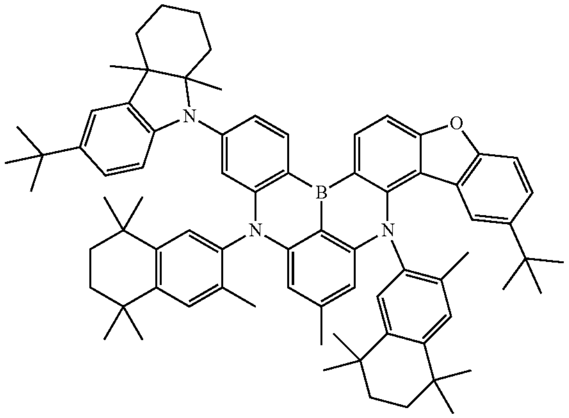
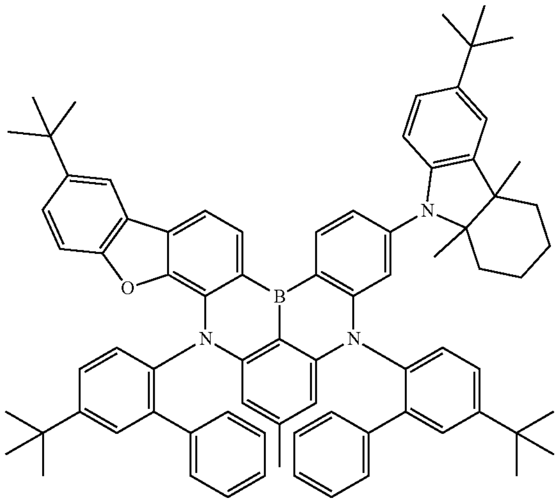
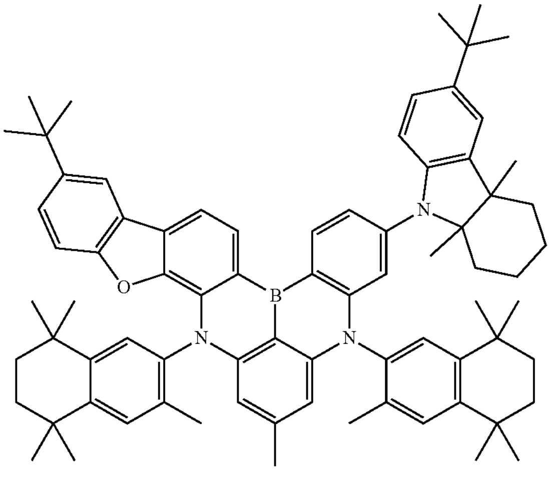

-continued
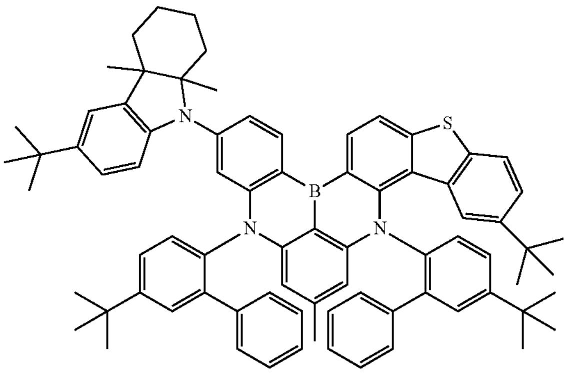
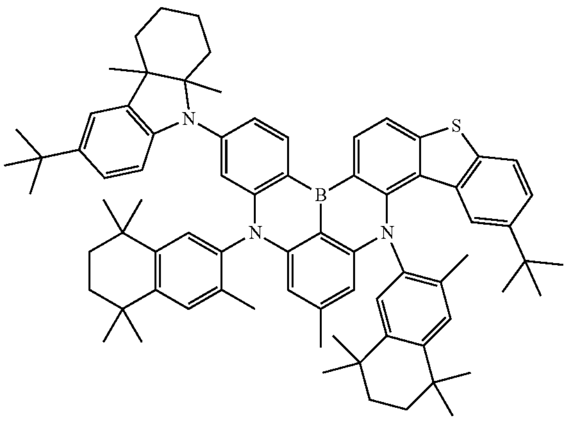
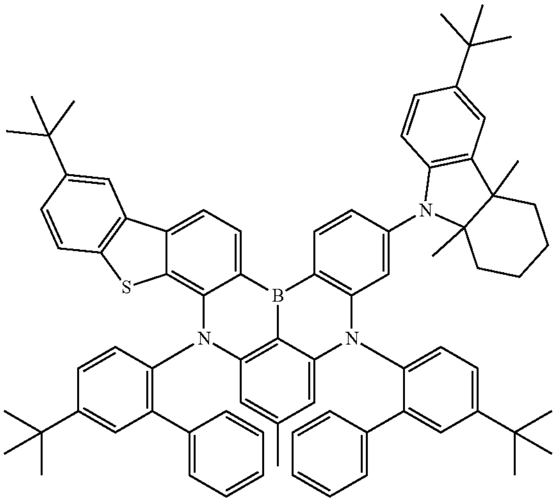
-continued
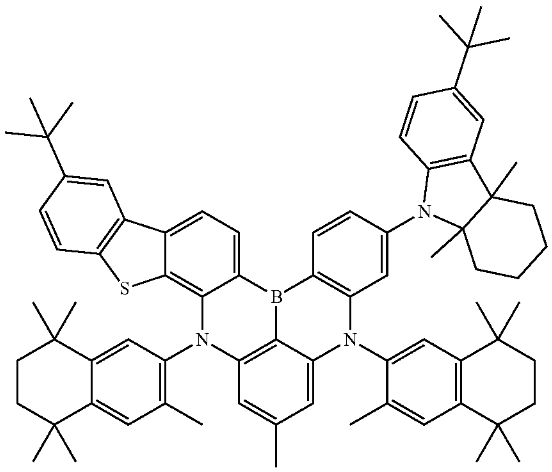
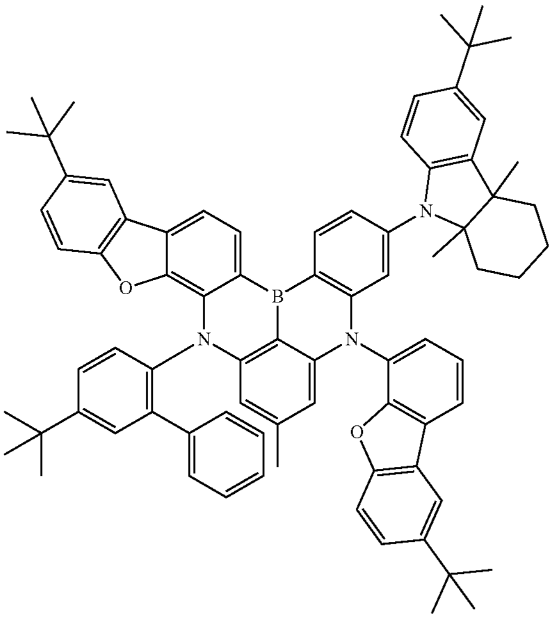
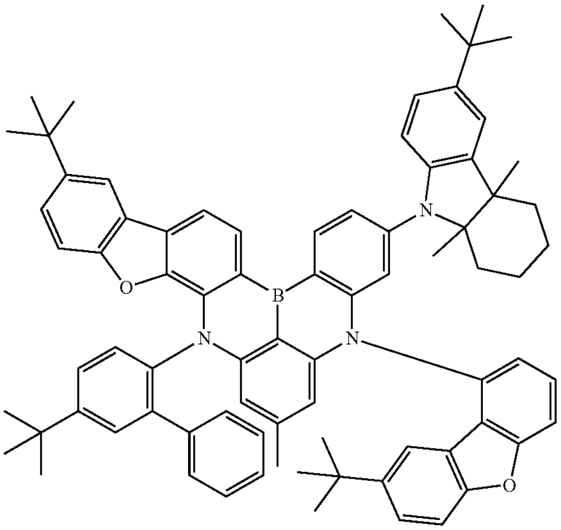

-continued
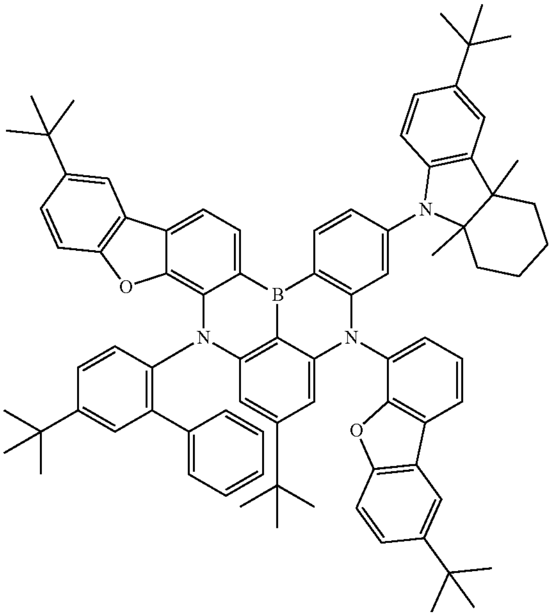
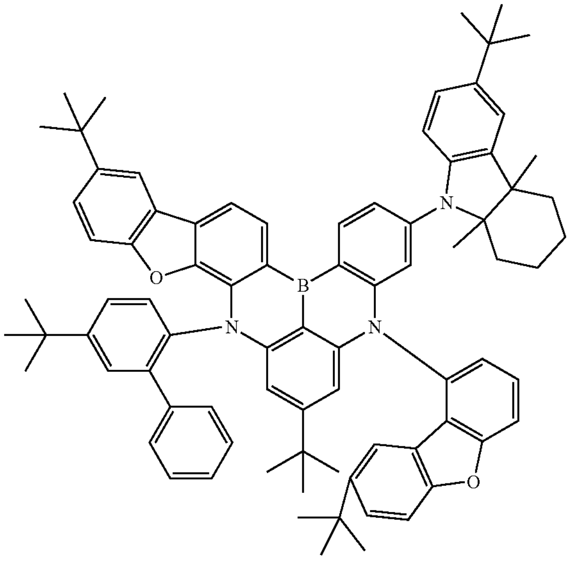
-continued
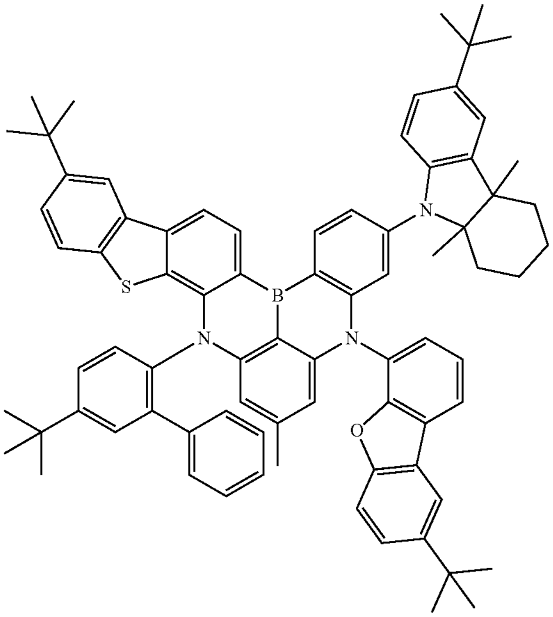
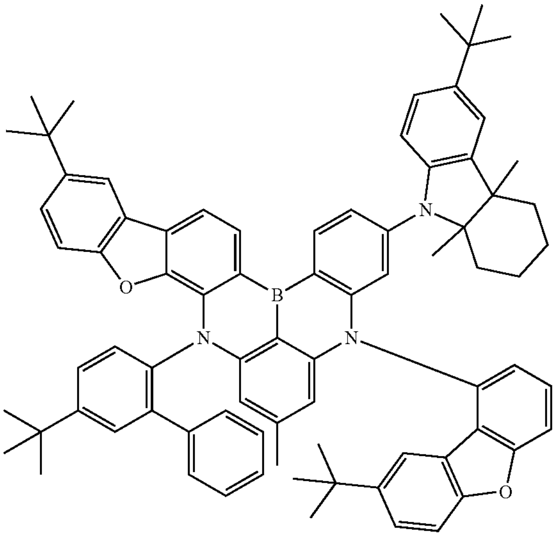

-continued
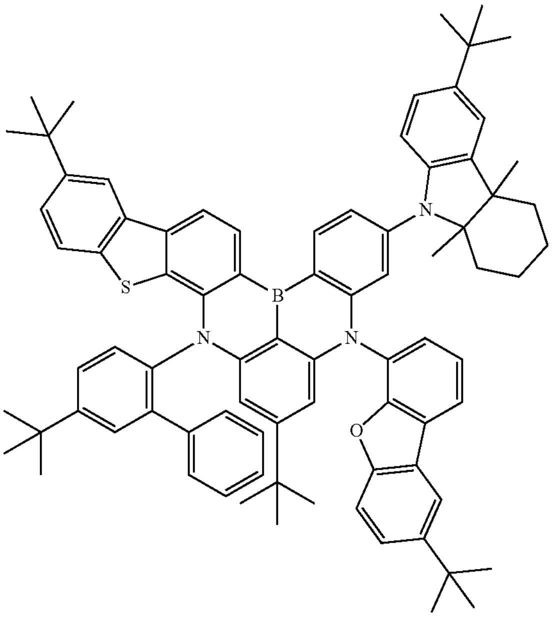
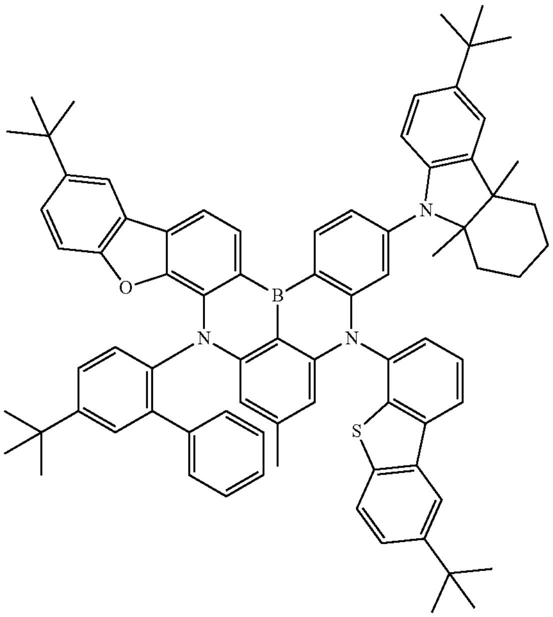
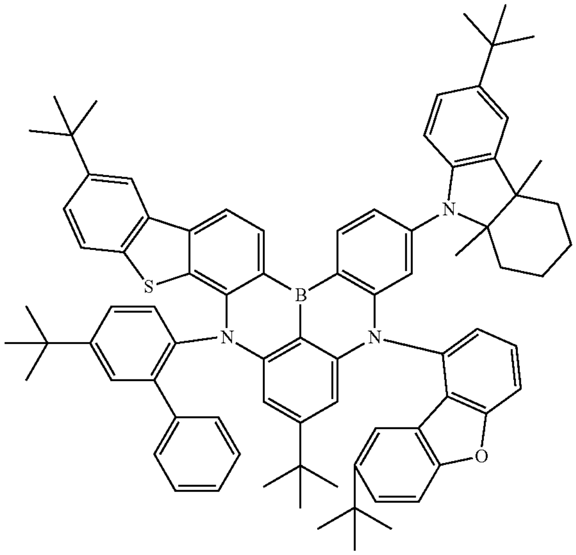
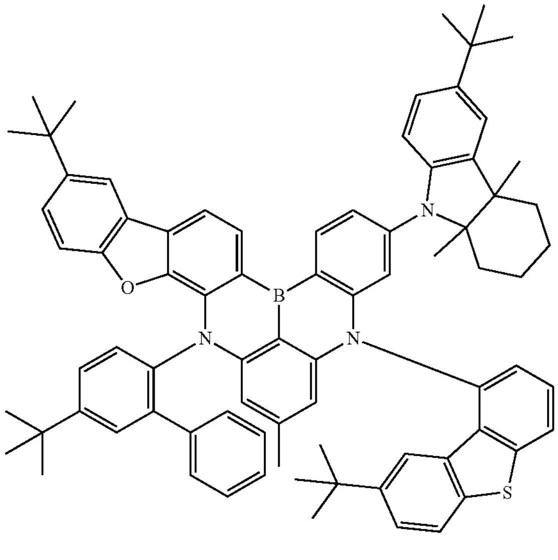

-continued
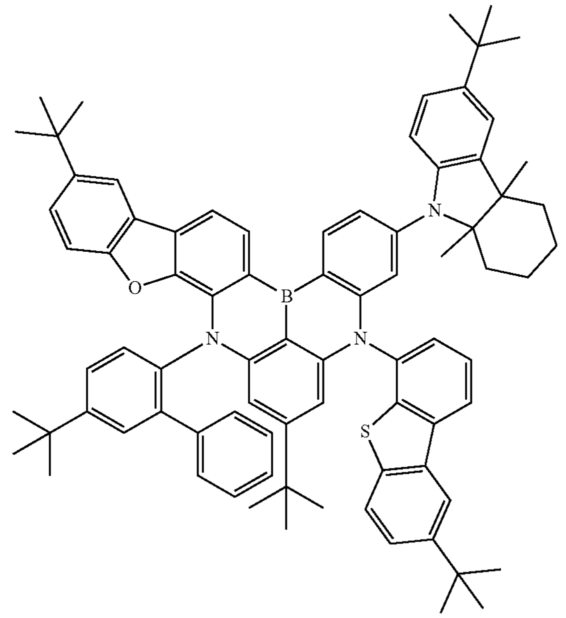
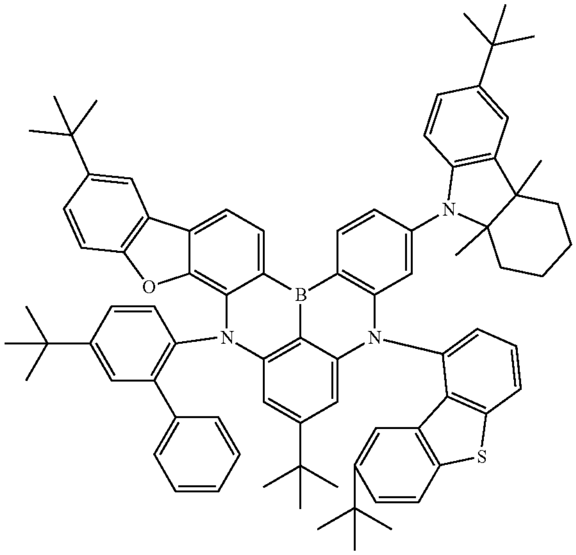
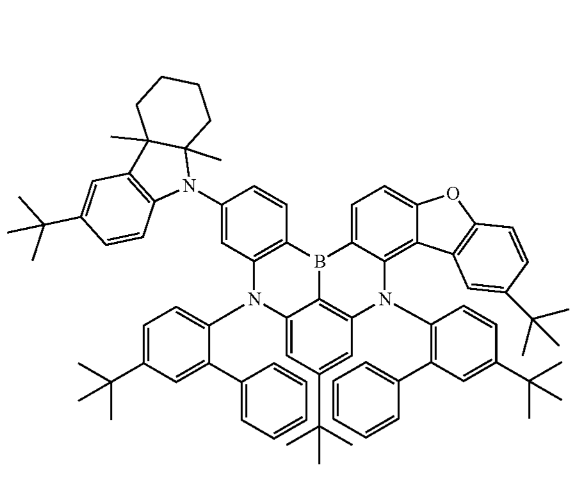
-continued
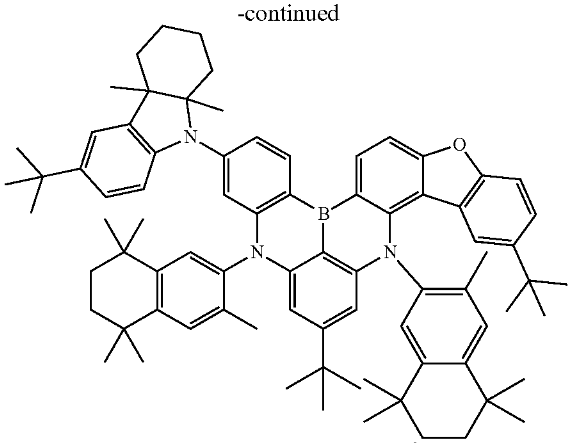
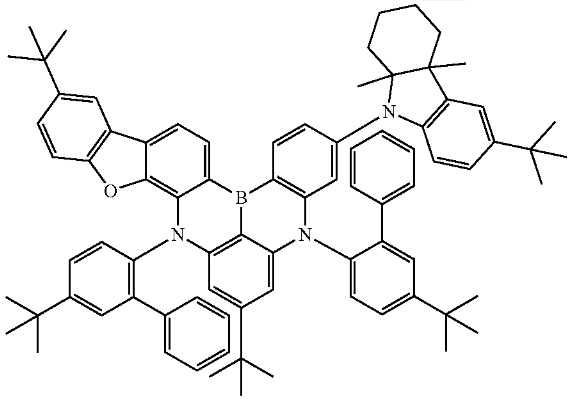
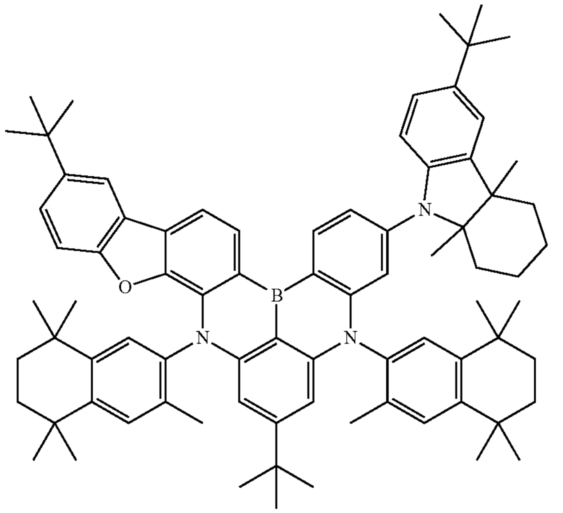
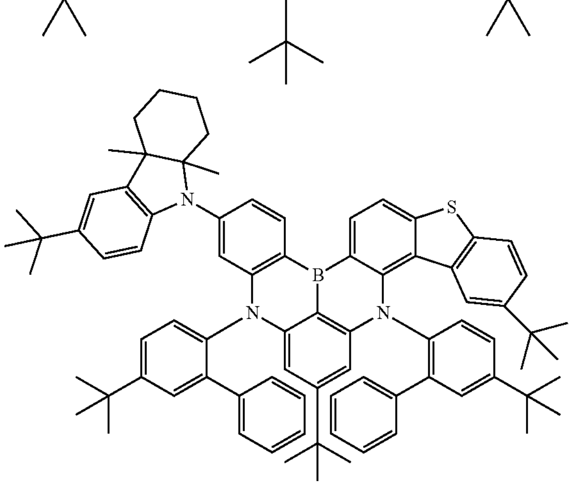

-continued
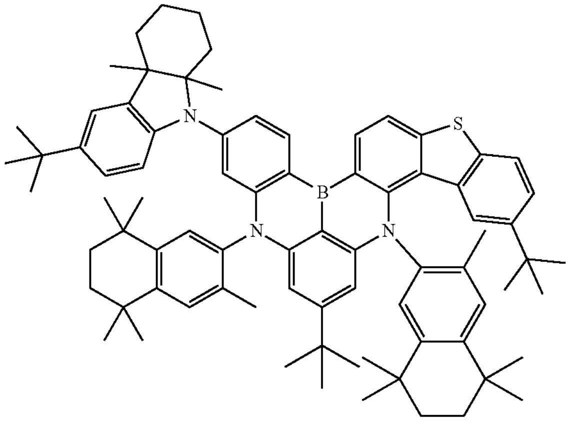
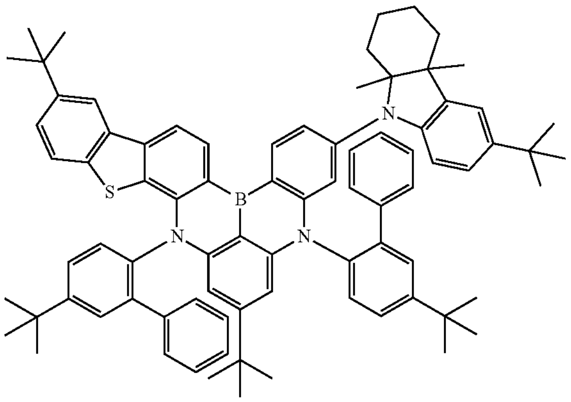
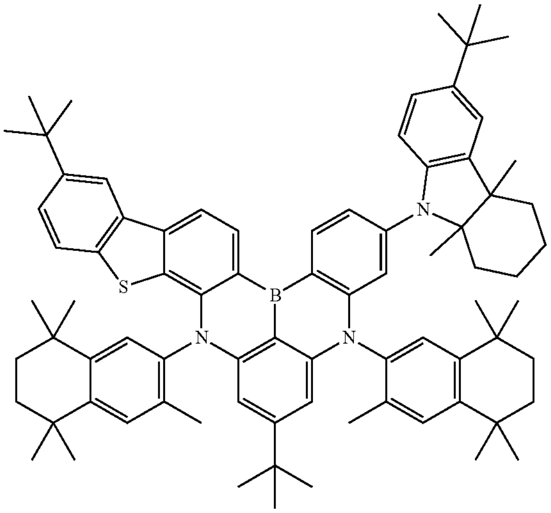
-continued
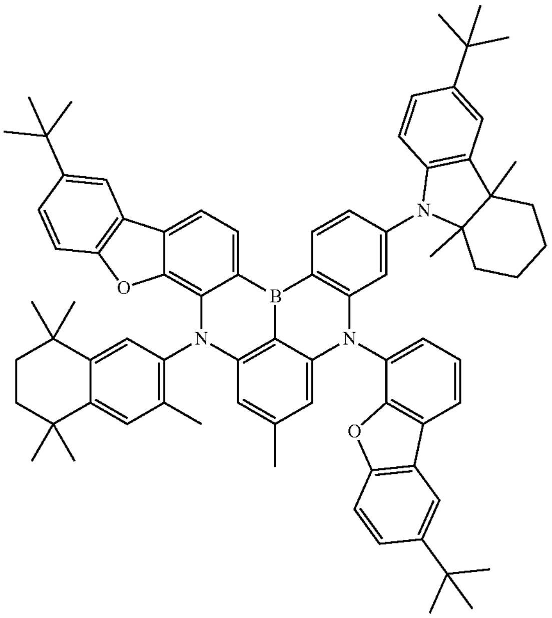
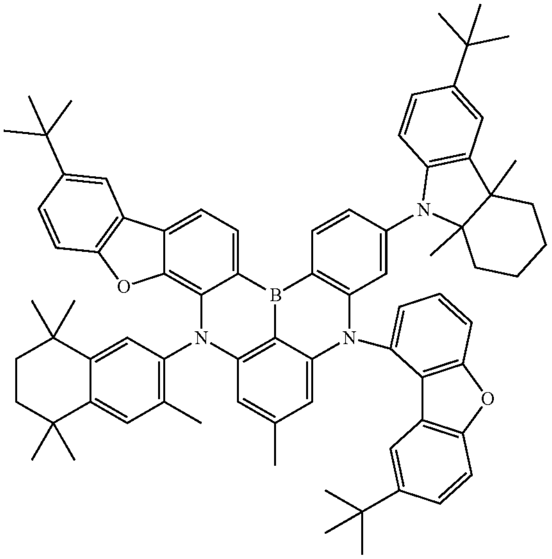

-continued
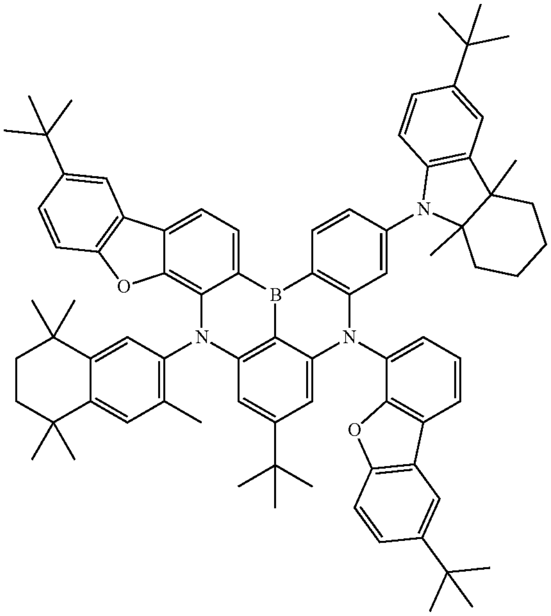
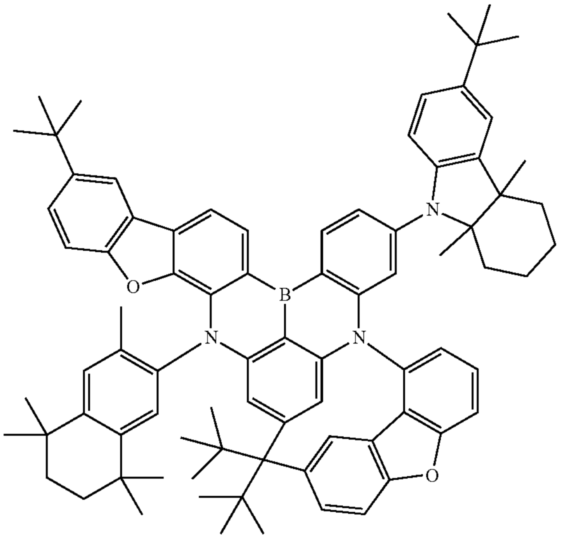
-continued
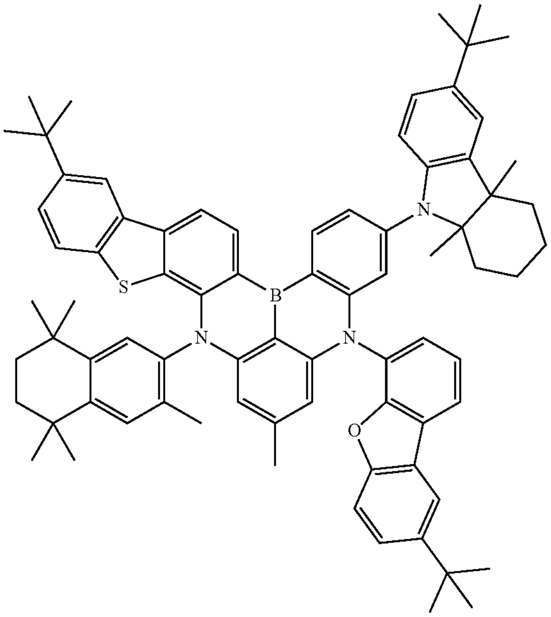
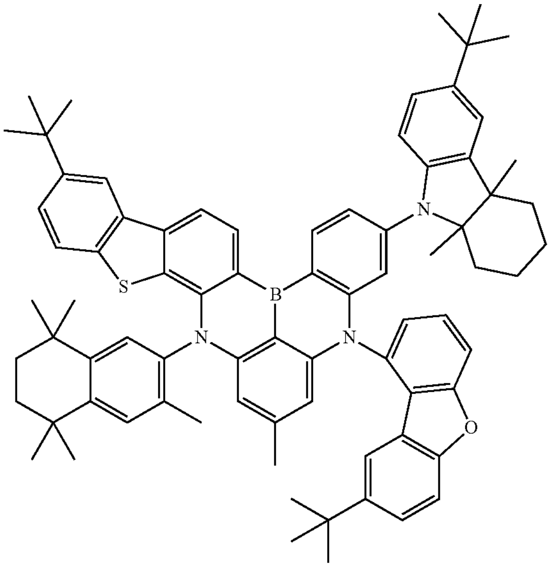

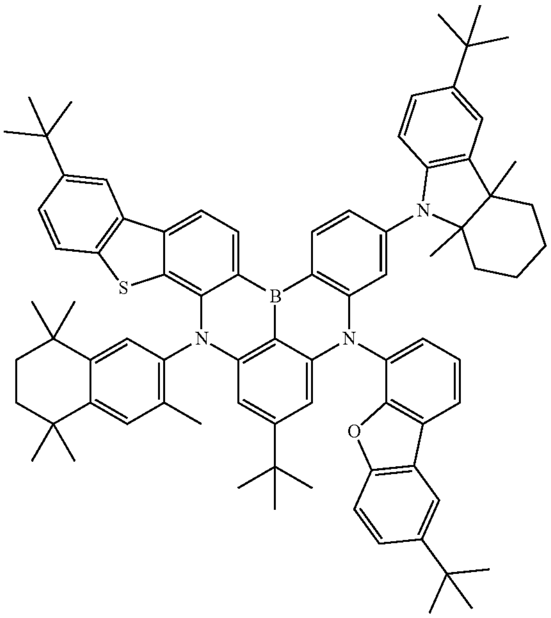
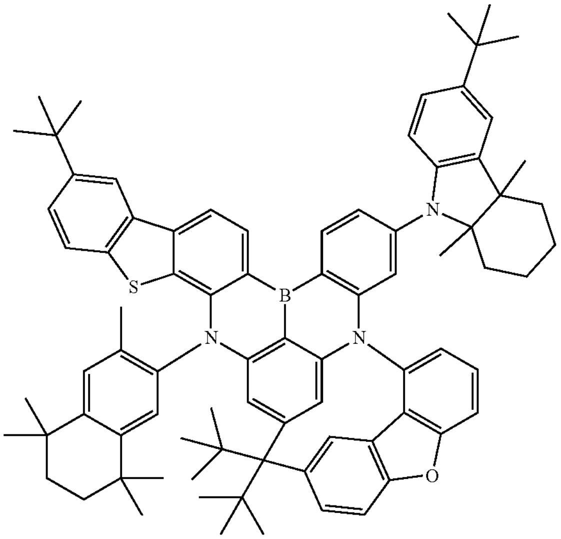
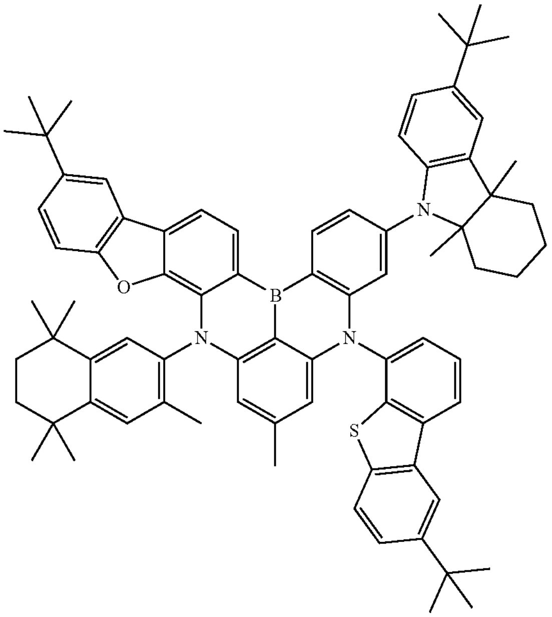
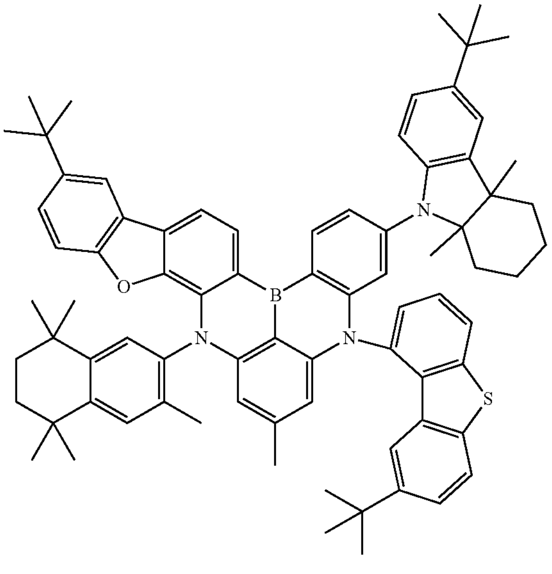

-continued
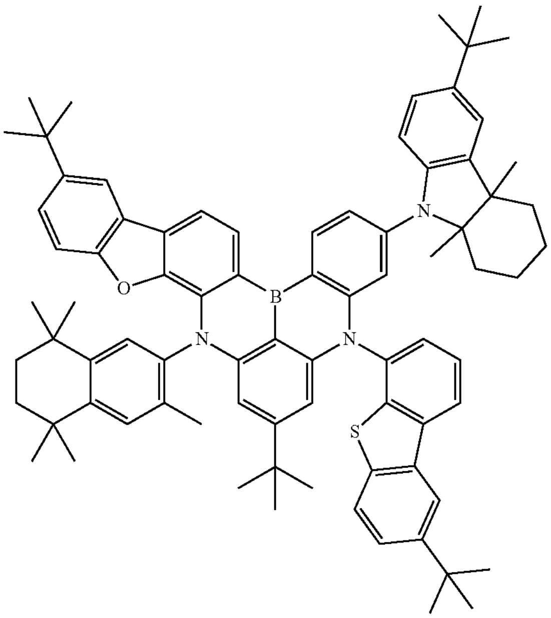
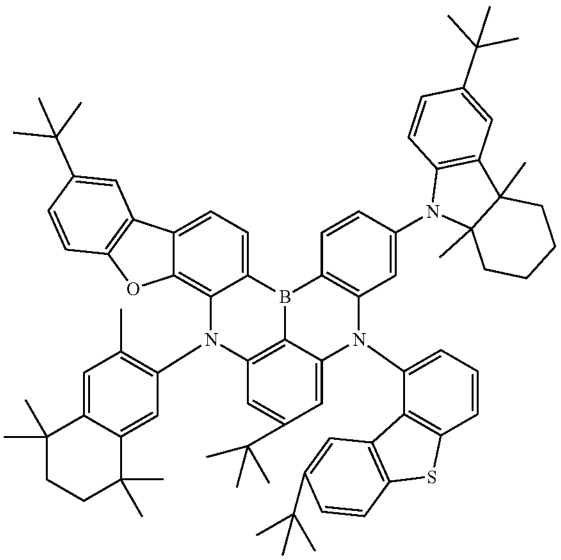
-continued
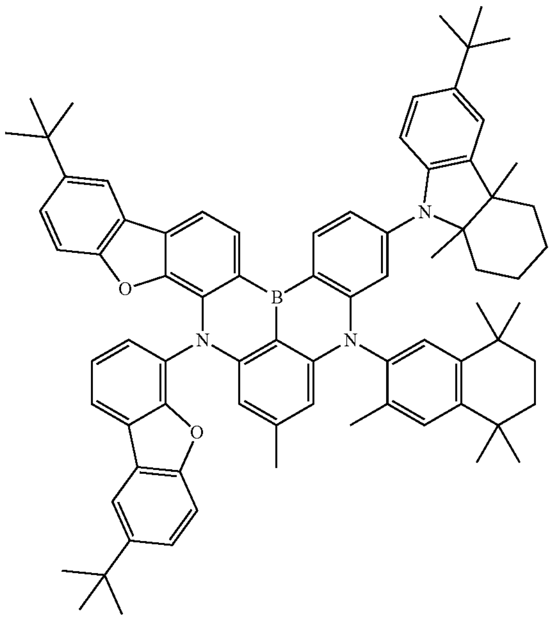
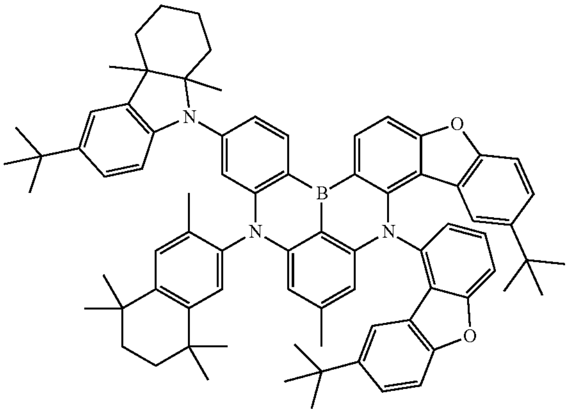
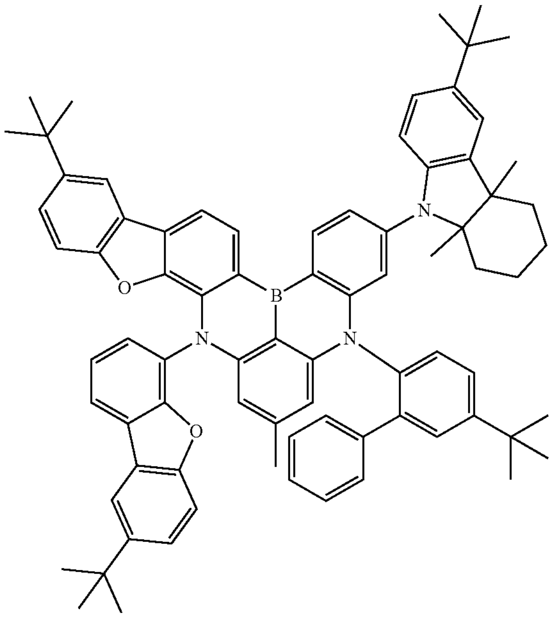

-continued
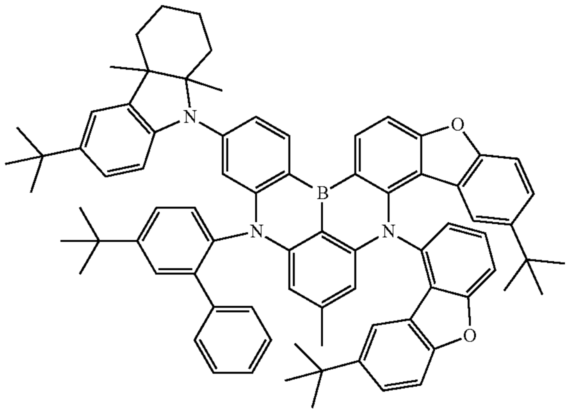
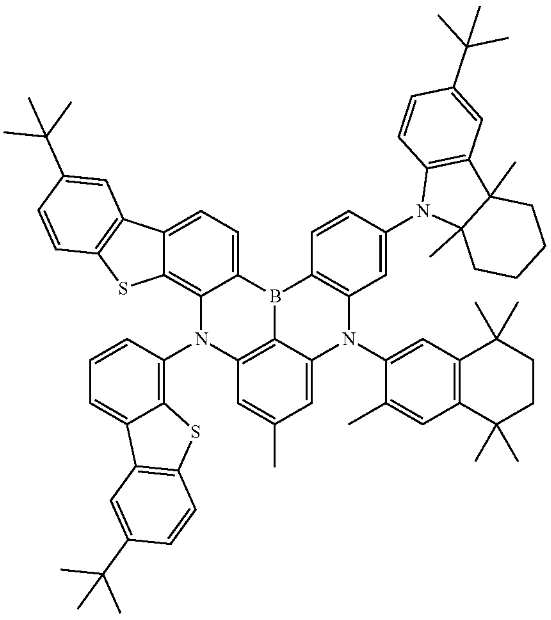
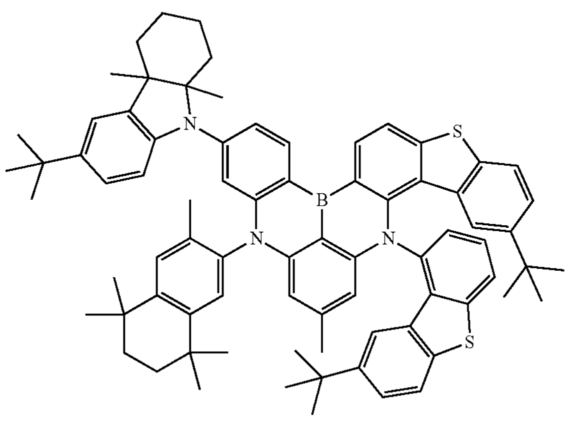
-continued
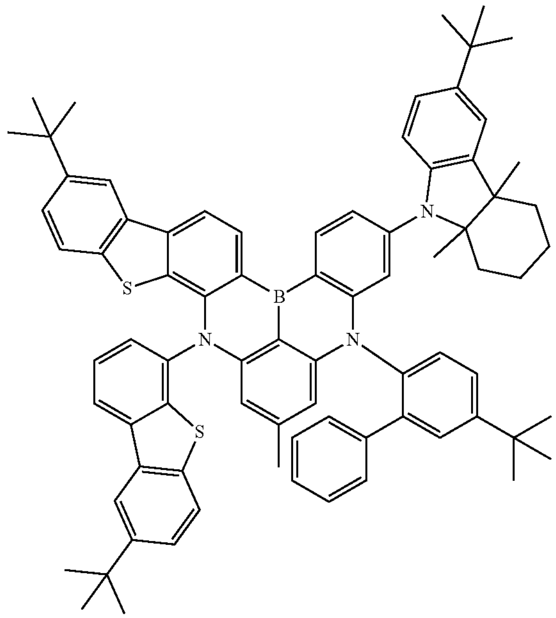
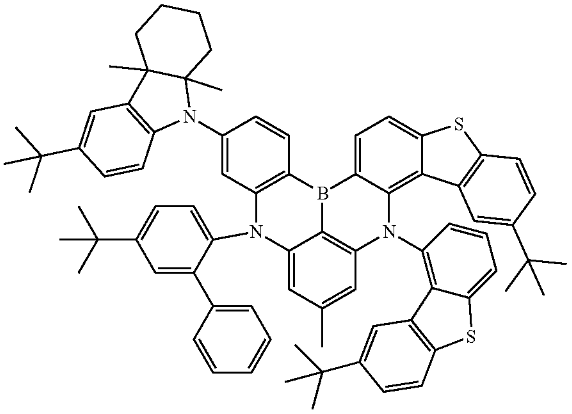
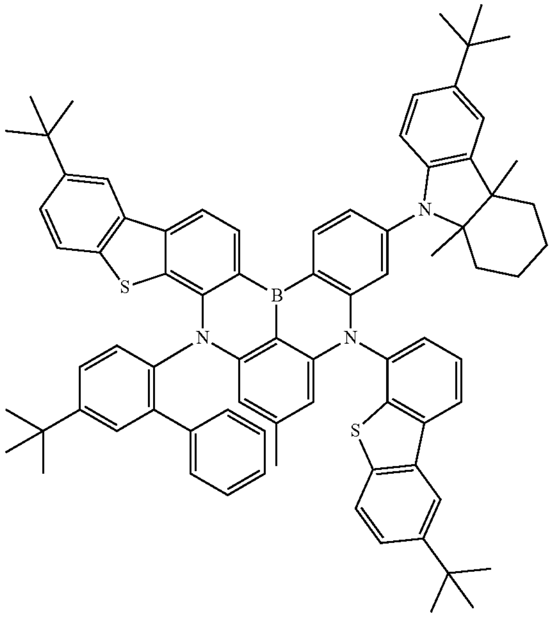

-continued
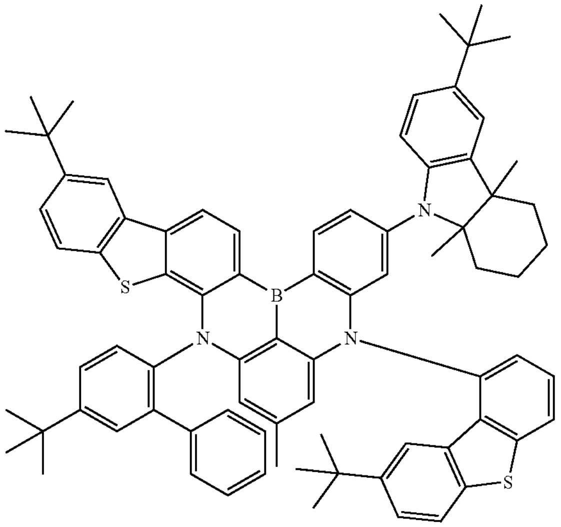
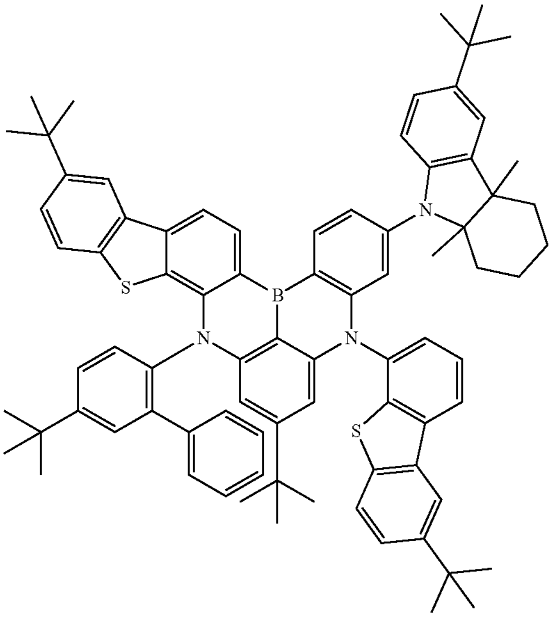
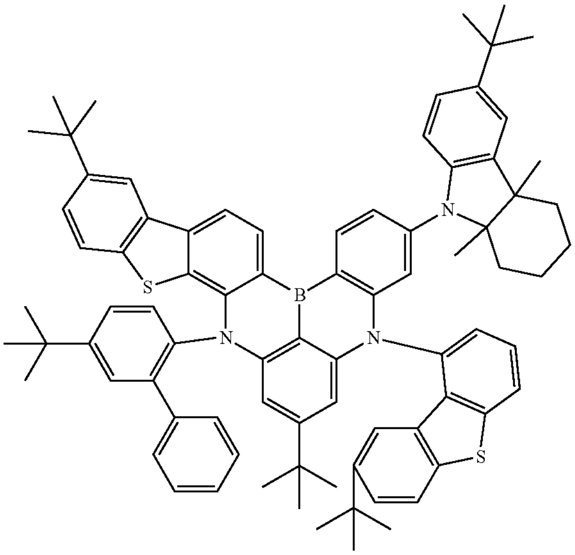
-continued
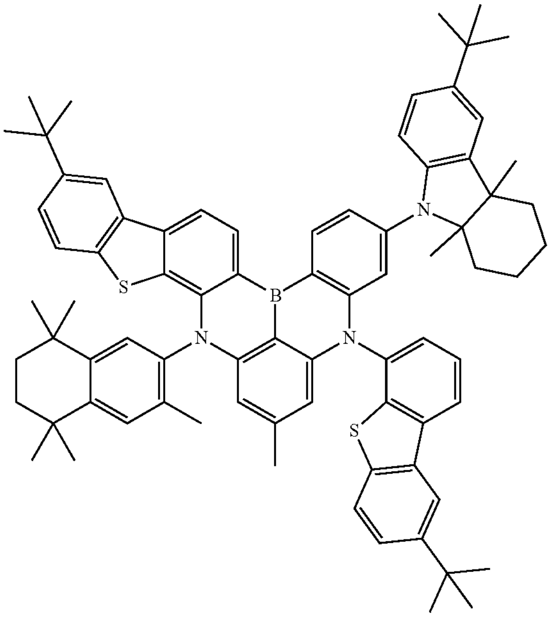
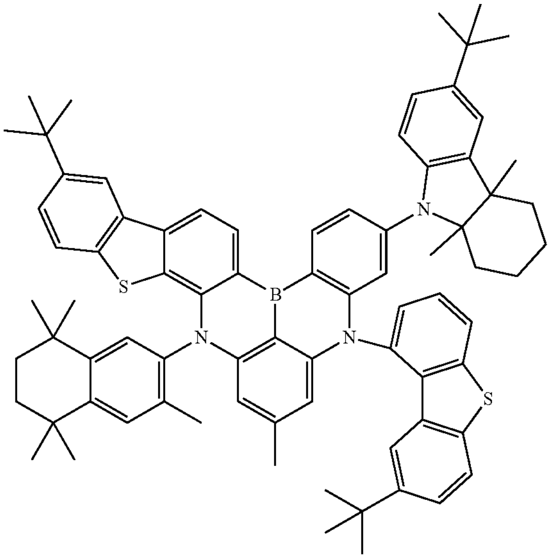

-continued
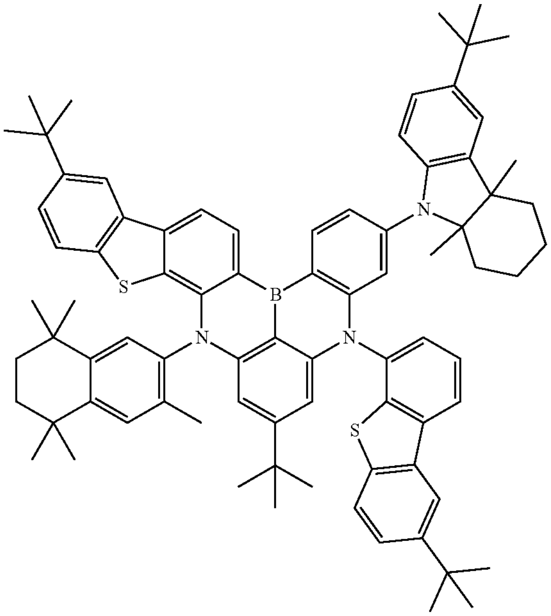
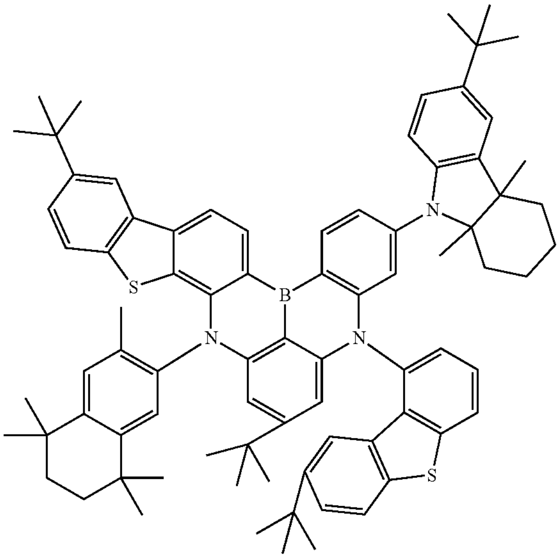
-continued
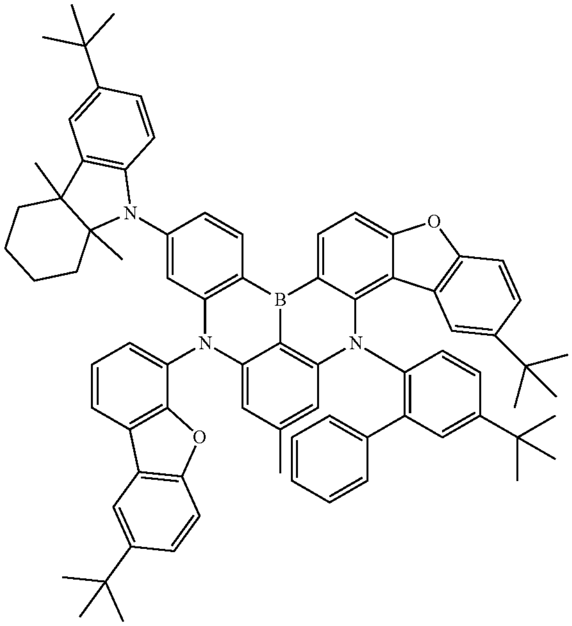
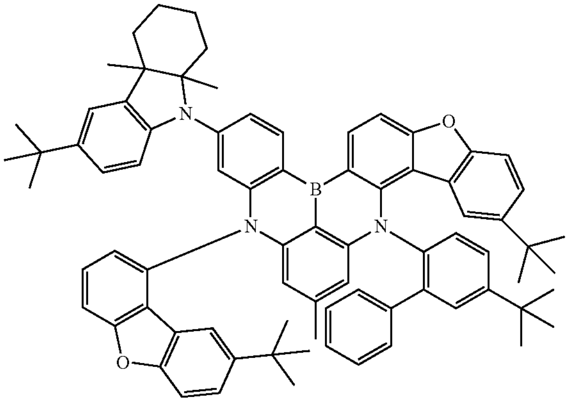
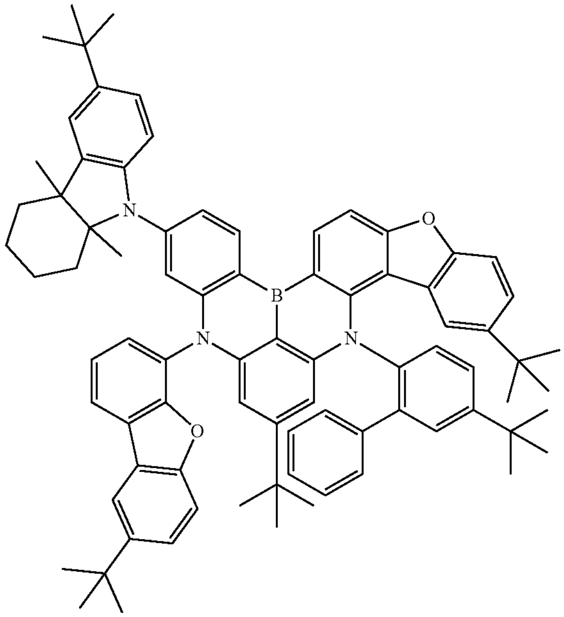

-continued
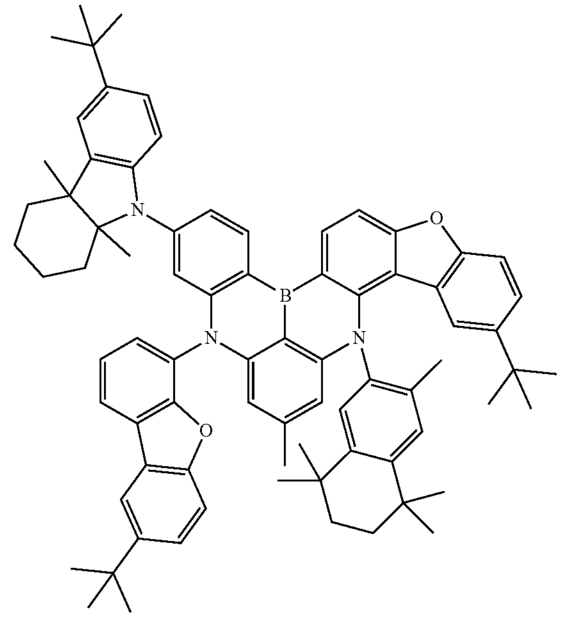
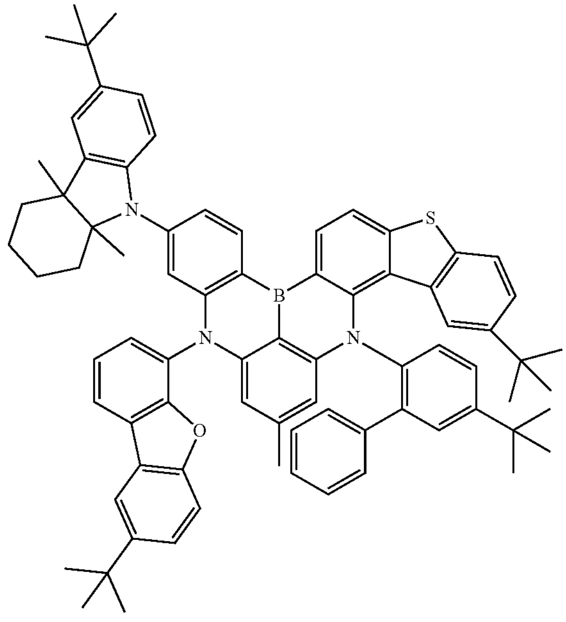
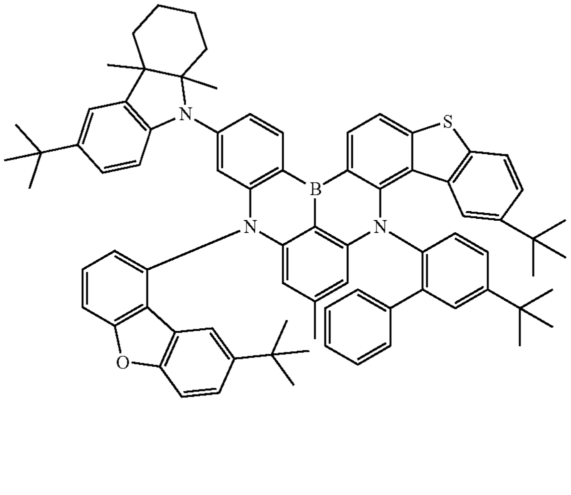
-continued
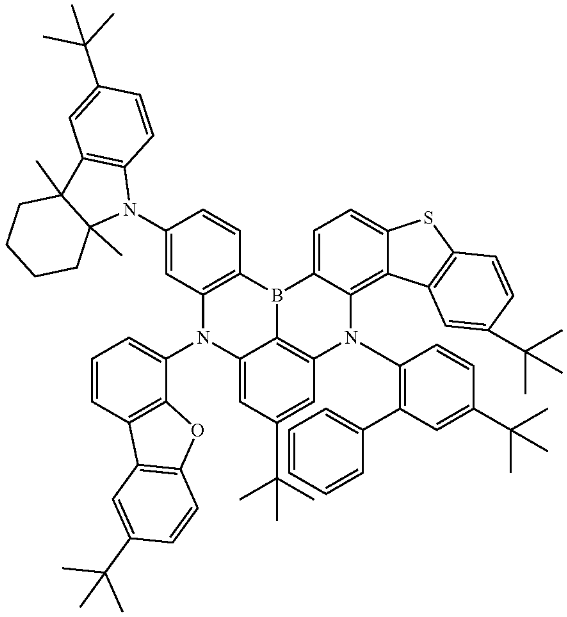
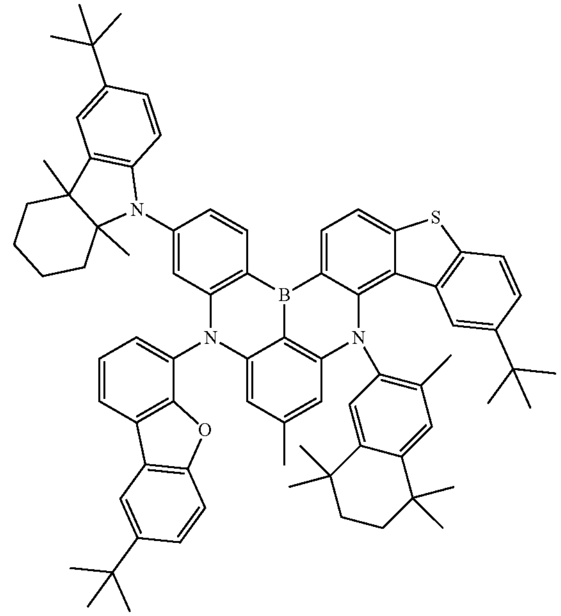

-continued
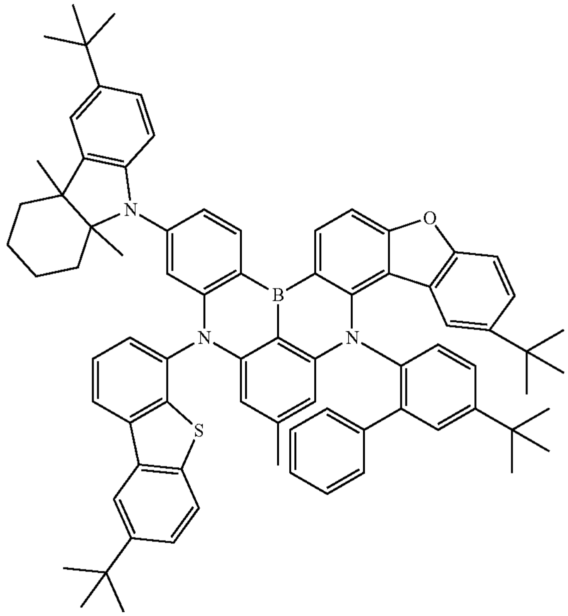
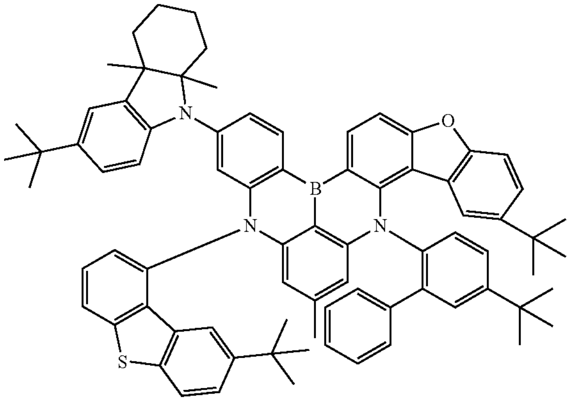
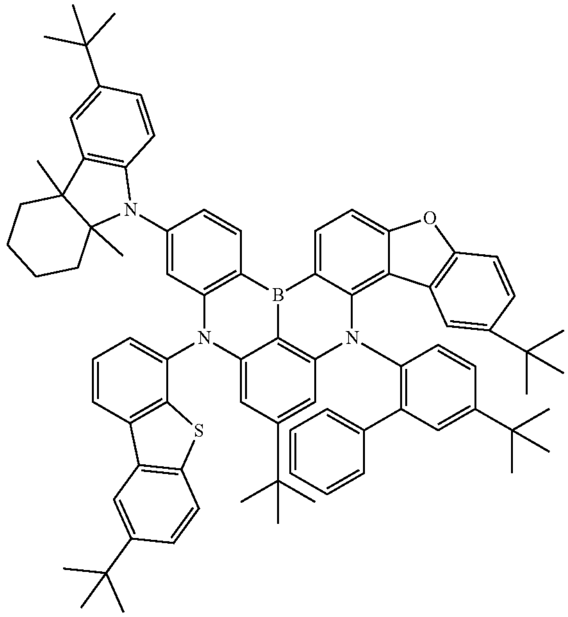
-continued
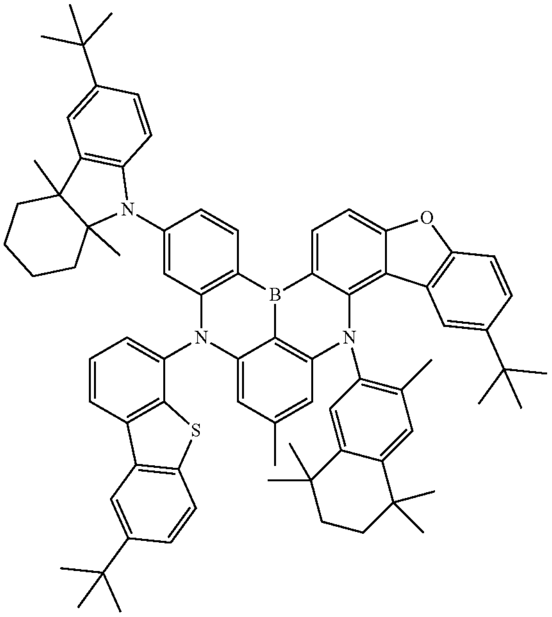
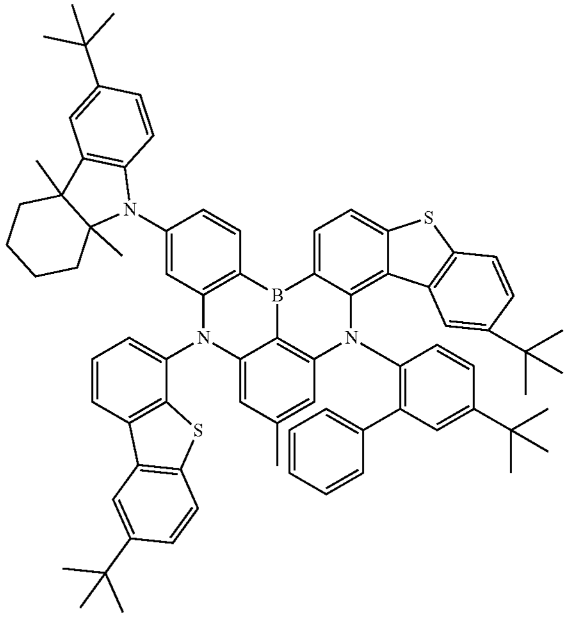
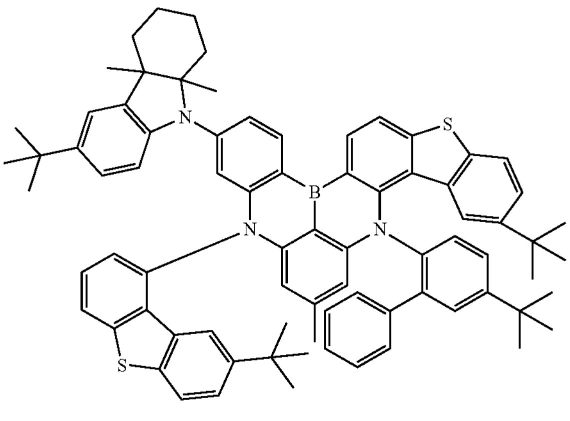

-continued
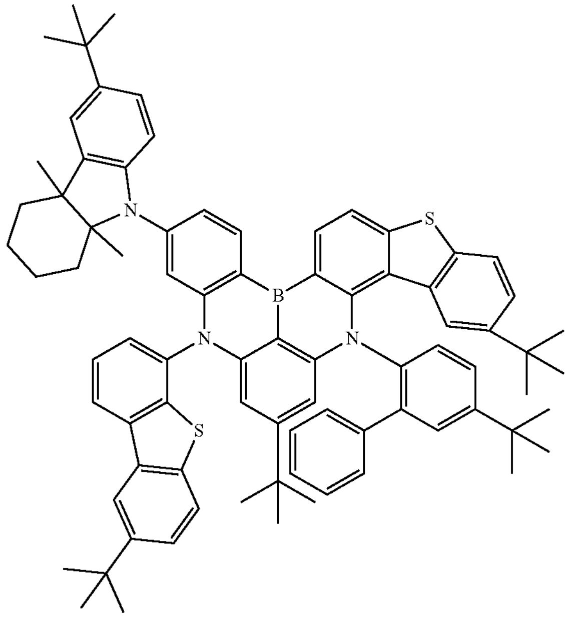
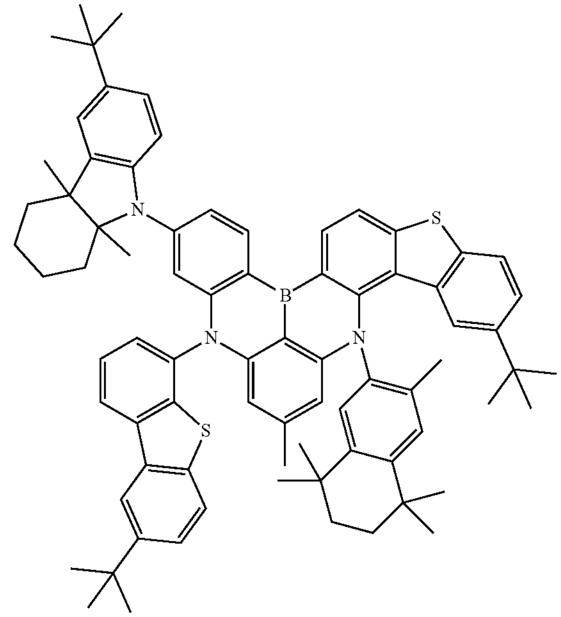
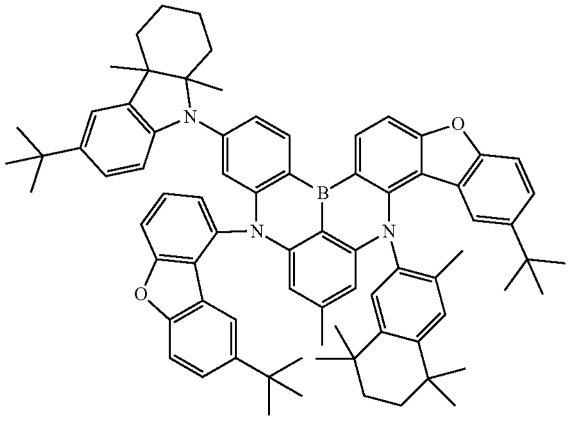
-continued
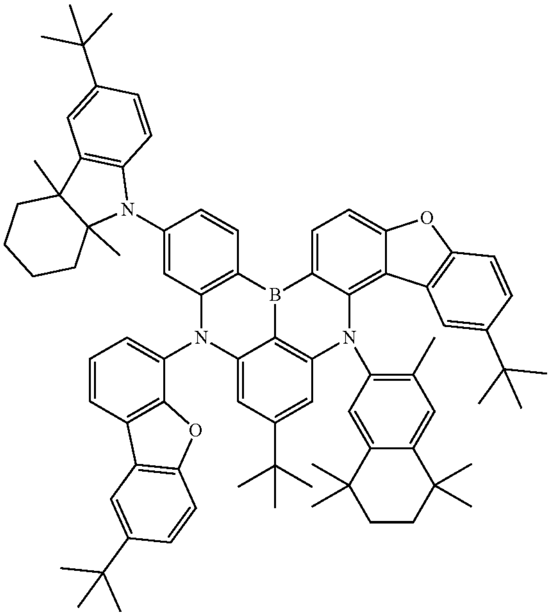
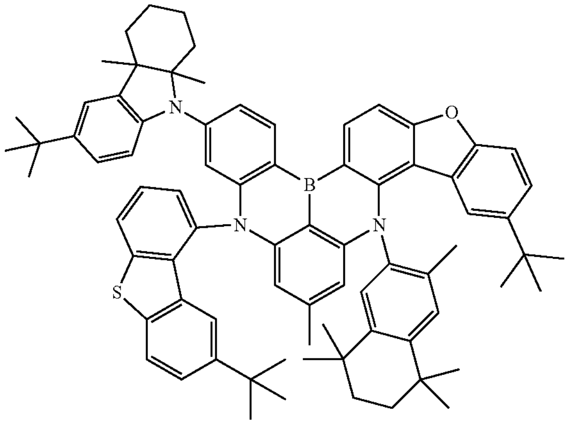
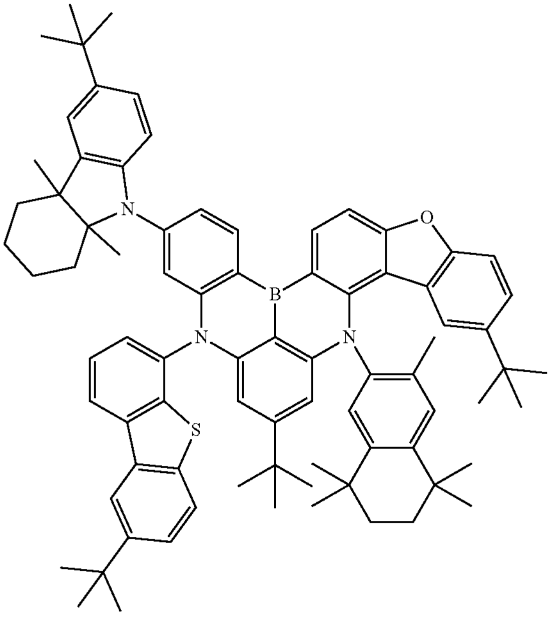

-continued

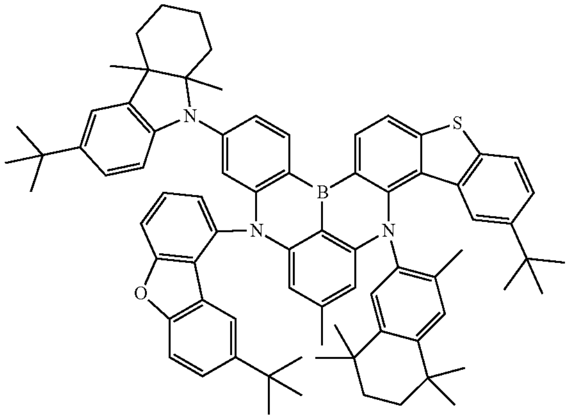

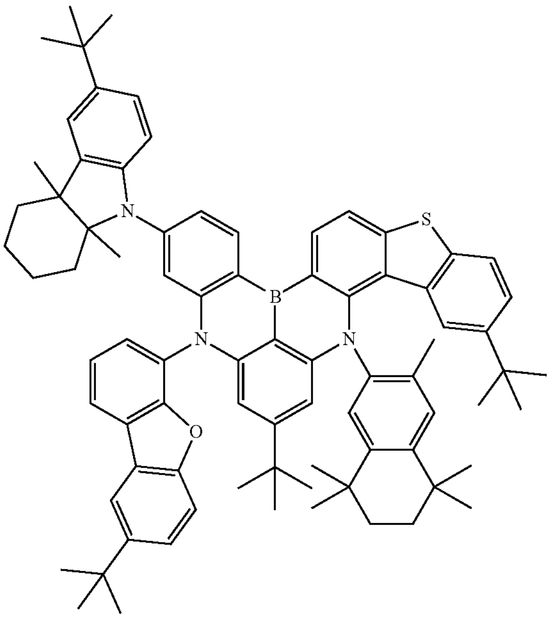

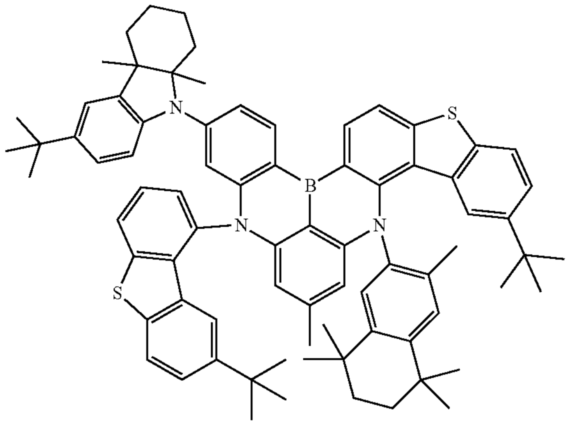

-continued

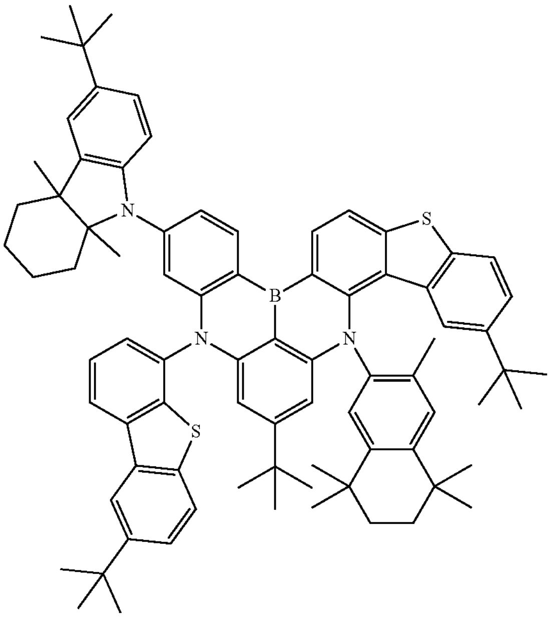

The following Reaction Schemes 1 and 2 exemplify a method for preparing a compound represented by Formula 1 according to an exemplary embodiment of the present specification, but are not limited thereto. The substituent may be bonded by a method known in the art, and the kind and position of the substituent or the number of substituents may be changed according to the technology known in the art.

<Reaction Scheme 1>

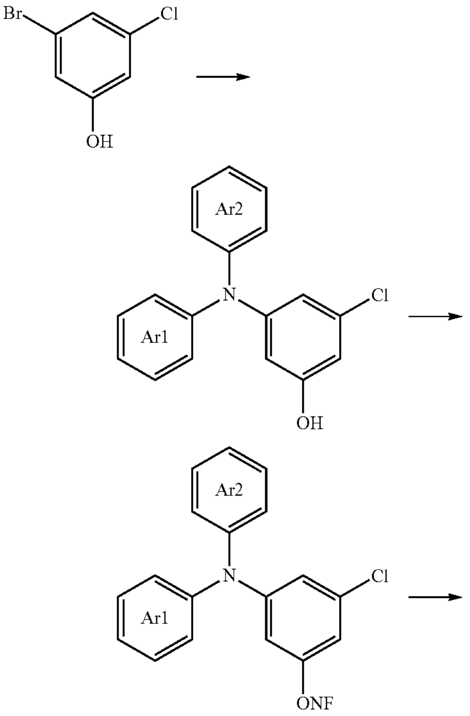

-continued
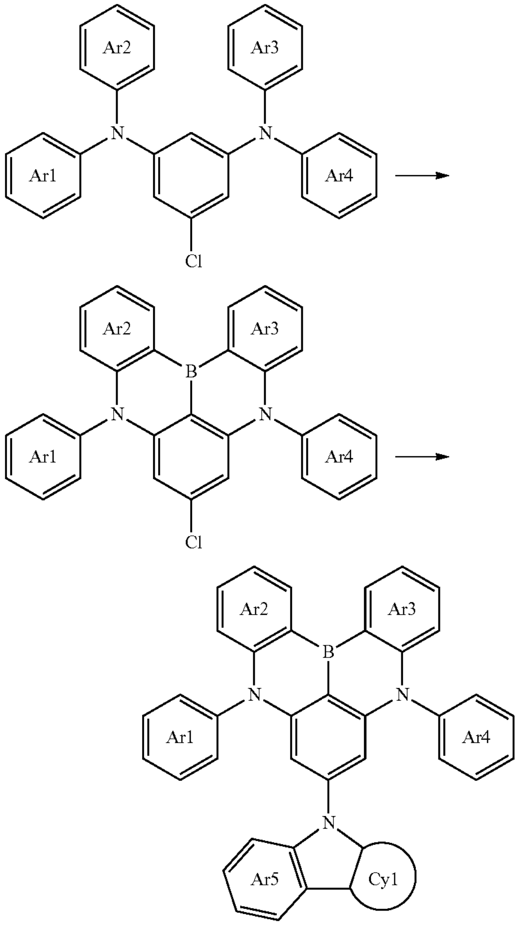
<Reaction Scheme 2>
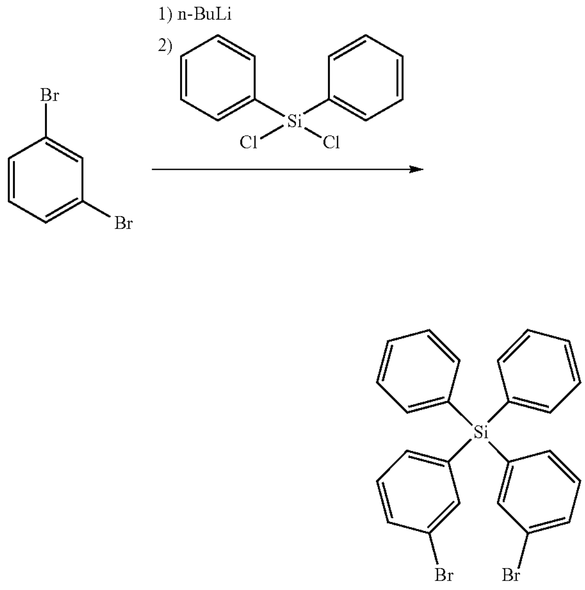
-continued
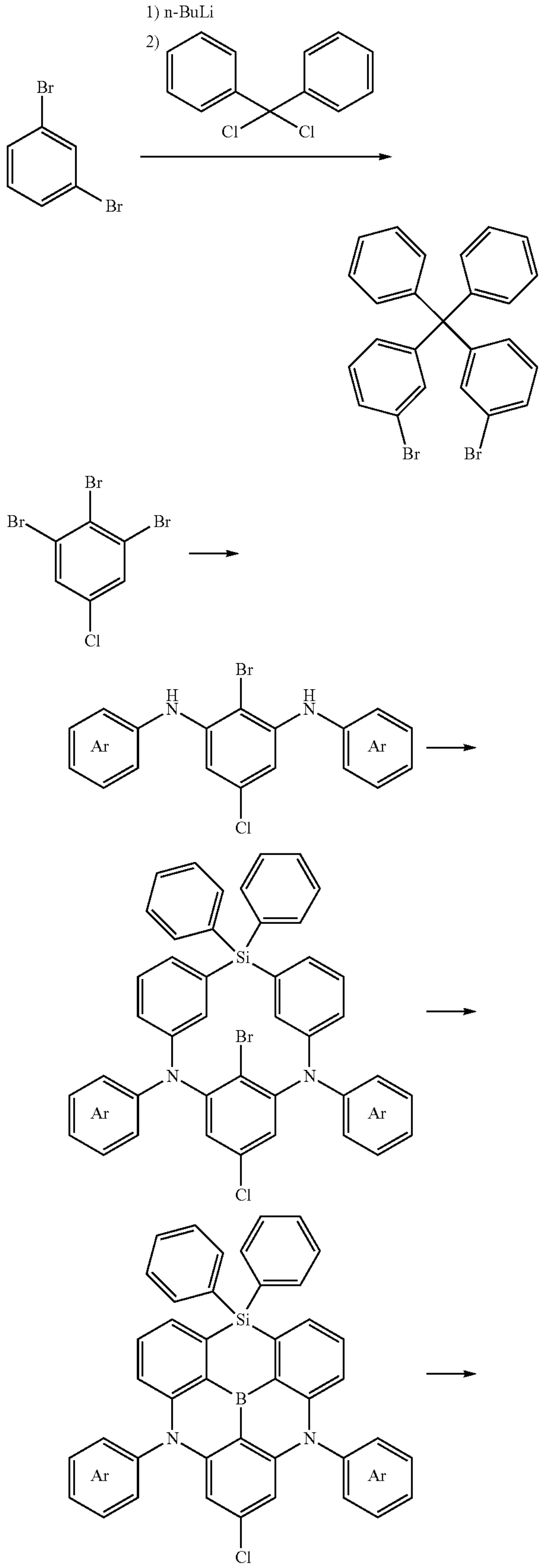

-continued

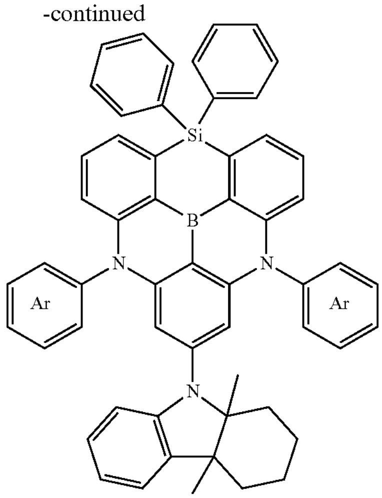

In addition, various substituents may be introduced into the core structure having the structure described above to synthesize compounds having inherent characteristics of the introduced substituents. For example, a substituent usually used for a hole injection layer material, a material for transporting holes, a light emitting layer material, and an electron transport layer material, which are used for manufacturing an organic light emitting device, may be introduced into the core structure to synthesize a material which satisfies conditions required for each organic material layer.

Furthermore, an organic light emitting device according to the present invention is an organic light emitting device including: a first electrode; a second electrode; and an organic material layer having one or more layers provided between the first electrode and the second electrode, in which one or more layers of the organic material layer include the above-described compound.

The organic light emitting device of the present invention may be manufactured using typical manufacturing methods and materials of an organic light emitting device, except that the above-described compound is used to form an organic material layer having one or more layers.

The compound may be formed as an organic material layer by not only a vacuum deposition method, but also a solution application method when an organic light emitting device is manufactured. Here, the solution application method means spin coating, dip coating, inkjet printing, screen printing, a spray method, roll coating, and the like, but is not limited thereto.

The organic material layer of the organic light emitting device of the present invention may be composed of a single-layered structure, but may be composed of a multi-layered structure in which two or more organic material layers are stacked. For example, the organic light emitting device of the present invention may have a structure including a hole injection layer, a hole transport layer, a layer which simultaneously injects and transports holes, an electron blocking layer, a light emitting layer, an electron transport layer, an electron injection layer, a layer which simultaneously injects and transport electrons, a hole blocking layer, and the like, as an organic material layer. However, the structure of the organic light emitting device is not limited thereto, and may include a fewer or greater number of organic material layers.

In the organic light emitting device of the present invention, the organic material layer may include one or more layers of an electron transport layer, an electron injection layer, and a layer which injects and transports electrons simultaneously, and one or more layers of the layers may include the compound represented by Formula 1.

In another organic light emitting device, the organic material layer may include an electron transport layer or an electron injection layer, and the electron transport layer or the electron injection layer may include the compound represented by Formula 1.

In the organic light emitting device of the present invention, the organic material layer may include one or more layers of a hole injection layer, a hole transport layer, and a layer which injects and transports holes simultaneously, and one or more layers of the layers may include the compound represented by Formula 1.

In still another organic light emitting device, the organic material layer may include a hole transport layer or a hole injection layer, and the hole transport layer or the hole injection layer may include the compound represented by Formula 1.

In another exemplary embodiment, the organic material layer includes a light emitting layer, and the light emitting layer includes the compound represented by Formula 1. As an example, the compound represented by Formula 1 may be included as a dopant of the light emitting layer.

According to an exemplary embodiment of the present specification, the compound represented by Formula 1 is included as a dopant of the light emitting layer, and the dopant is included in an amount of 0.1 part by weight to 10 parts by weight, preferably 1 part by weight to 5 parts by weight, based on 100 parts by weight of the light emitting layer.

In an exemplary embodiment of the present specification, the organic light emitting device is a green organic light emitting device in which the light emitting layer includes the compound represented by Formula 1 as a dopant.

According to an exemplary embodiment of the present specification, the organic light emitting device is a red organic light emitting device in which the light emitting layer includes the compound represented by Formula 1 as a dopant.

In another exemplary embodiment, the organic light emitting device is a blue organic light emitting device in which the light emitting layer includes the compound represented by Formula 1 as a dopant.

As another example, the organic material layer including the compound represented by Formula 1 may include the compound represented by Formula 1 as a dopant, and may include an organic compound such as an anthracene-based compound as a host.

As still another example, the organic material layer including the compound represented by Formula 1 may include the compound represented by Formula 1 as a dopant, and may include a fluorescent host or a phosphorescent host.

In still another exemplary embodiment, the organic material layer including the compound represented by Formula 1 may include the compound represented by Formula 1 as a dopant, include a fluorescent host or a phosphorescent host, and include another organic compound, a metal or a metal compound as a dopant.

As yet another example, the organic material layer including the compound represented by Formula 1 may include the compound represented by Formula 1 as a dopant and include a fluorescent host or a phosphorescent host, and may be used with an iridium (Ir)-based dopant.

According to an exemplary embodiment of the present specification, the organic light emitting device includes a light emitting layer, and the light emitting layer includes the compound represented by Formula 1 and a compound represented by the following Formula H.

[Formula H]

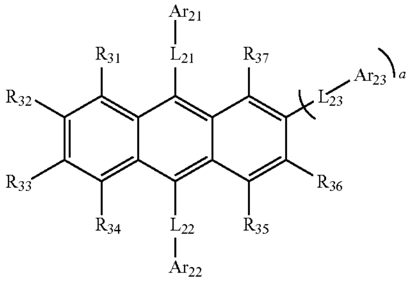

In Formula H, $L_{21}$ to $L_{23}$ are the same as or different from each other, and are each independently a direct bond; a substituted or unsubstituted arylene group; or a substituted or unsubstituted heteroarylene group, $R_{31}$ to $R_{37}$ are the same as or different from each other, and are each independently hydrogen; deuterium; a substituted or unsubstituted alkyl group; a substituted or unsubstituted cycloalkyl group; a substituted or unsubstituted silyl group; a substituted or unsubstituted aryl group; or a substituted or unsubstituted heteroaryl group, $Ar_{21}$ to $Ar_{23}$ are the same as or different from each other, and are each independently a substituted or unsubstituted aryl group; or a substituted or unsubstituted heteroaryl group, and a is 0 or 1.

In an exemplary embodiment of the present specification, when a is 0, hydrogen or deuterium is linked to the position of $-L_{23}$-$Ar_{23}$.

In an exemplary embodiment of the present specification, $L_{21}$ to $L_{23}$ are the same as or different from each other, and are each independently a direct bond; a substituted or unsubstituted C6-C30 arylene group; or a C2-C30 heteroarylene group which is substituted or unsubstituted and includes N, O, or S.

In an exemplary embodiment of the present specification, $L_{21}$ to $L_{23}$ are the same as or different from each other, and are each independently a direct bond; a C6-C30 arylene group; or a C2-C30 heteroarylene group including N, O, or S, and the arylene group or heterarylene group is unsubstituted or substituted with a C1-C10 alkyl group, a C6-C30 aryl group, or a C2-C30 heteroaryl group.

In an exemplary embodiment of the present specification, L21 to L23 are the same as or different from each other, and are each independently a direct bond; a substituted or unsubstituted phenylene group; a substituted or unsubstituted biphenylene group; a substituted or unsubstituted naphthylene group; a substituted or unsubstituted divalent dibenzofuran group; or a substituted or unsubstituted divalent dibenzothiophene group.

In an exemplary embodiment of the present specification, $Ar_{21}$ to $Ar_{23}$ are the same as or different from each other, and are each independently a substituted or unsubstituted C6-C30 aryl group; or a substituted or unsubstituted C2-C30 heteroaryl group.

In an exemplary embodiment of the present specification, $Ar_{21}$ to $Ar_{23}$ are the same as or different from each other, and are each independently a C6-C30 aryl group which is unsubstituted or substituted with deuterium; or a C2-C30 heteroaryl group which is unsubstituted or substituted with deuterium.

In an exemplary embodiment of the present specification, $Ar_{21}$ to $Ar_{23}$ are the same as or different from each other, and are each independently a substituted or unsubstituted monocyclic to tetracyclic aryl group; or a substituted or unsubstituted monocyclic to tetracyclic heteroaryl group.

In an exemplary embodiment of the present specification, $Ar_{21}$ to $Ar_{23}$ are the same as or different from each other, and are each independently a monocyclic to tetracyclic aryl group which is unsubstituted or substituted with deuterium; or a monocyclic to tetracyclic heteroaryl group which is unsubstituted or substituted with deuterium.

In an exemplary embodiment of the present specification, $Ar_{21}$ to $Ar_{23}$ are the same as or different from each other, and are each independently a substituted or unsubstituted phenyl group; a substituted or unsubstituted biphenyl group; a substituted or unsubstituted terphenyl group; a substituted or unsubstituted naphthyl group; a substituted or unsubstituted anthracene group; a substituted or unsubstituted phenanthryl group; a substituted or unsubstituted phenalene group; a substituted or unsubstituted fluorenyl group; a substituted or unsubstituted benzofluorenyl group; a substituted or unsubstituted furan group; a substituted or unsubstituted thiophene group; a substituted or unsubstituted dibenzofuran group; a substituted or unsubstituted naphthobenzofuran group; a substituted or unsubstituted dibenzothiophene group; or a substituted or unsubstituted naphthobenzothiophene group.

In an exemplary embodiment of the present specification, $Ar_{21}$ and $Ar_{22}$ are different from each other.

In an exemplary embodiment of the present specification, $Ar_{21}$ is a substituted or unsubstituted aryl group, and $Ar_{22}$ is a substituted or unsubstituted aryl group.

In an exemplary embodiment of the present specification, $Ar_{21}$ is a substituted or unsubstituted aryl group, and $Ar_{22}$ is a substituted or unsubstituted heteroaryl group.

In an exemplary embodiment of the present specification, $Ar_{21}$ is an aryl group which is unsubstituted or substituted with deuterium, and $Ar_{22}$ is an aryl group which is unsubstituted or substituted with deuterium.

In an exemplary embodiment of the present specification, $Ar_{21}$ is an aryl group which is unsubstituted or substituted with deuterium, and $Ar_{22}$ is a heteroaryl group which is unsubstituted or substituted with deuterium.

In an exemplary embodiment of the present specification, $R_{31}$ to $R_{37}$ are the same as or different from each other, and are each independently hydrogen or deuterium.

In an exemplary embodiment of the present specification, $R_{31}$ to $R_{37}$ are hydrogen.

In an exemplary embodiment of the present specification, $R_{31}$ to $R_{37}$ are deuterium.

In an exemplary embodiment of the present specification, Formula H is represented by the following Formula H01 or H02.

[Formula H01]

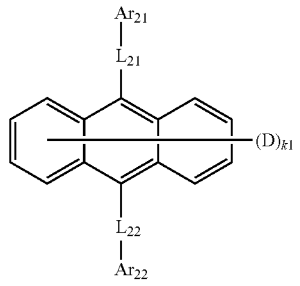

[Formula H02]
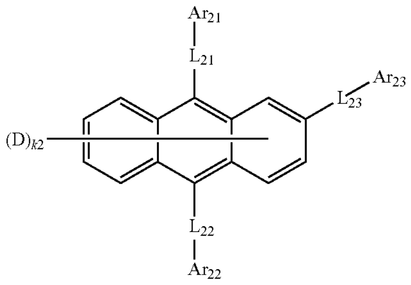
In Formulae H01 and H02,
definitions of $L_{21}$ to $L_{23}$ and $Ar_{21}$ to $Ar_{23}$ are the same as those defined in Formula H, D means deuterium, k1 is 0 to 8, and k2 is an integer from 0 to 7.
In an exemplary embodiment of the present specification, the compound represented by Formula H is any one selected from the following compounds.
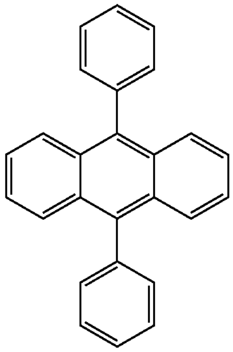
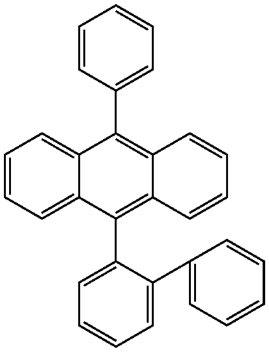
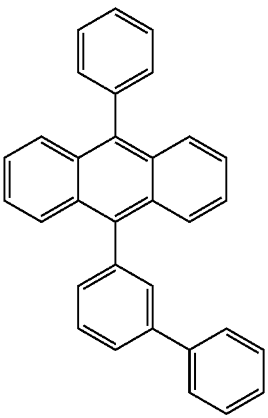
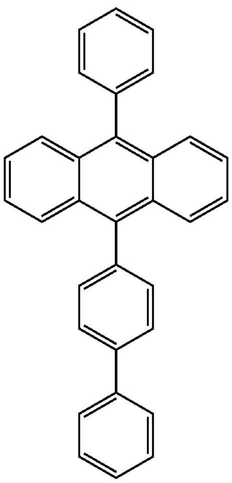
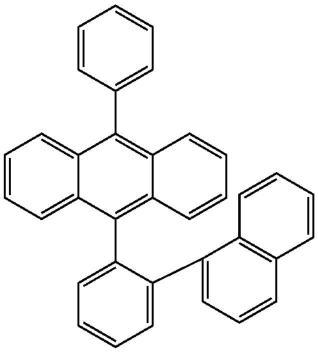
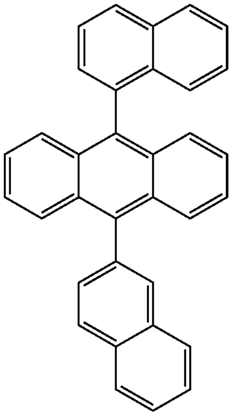
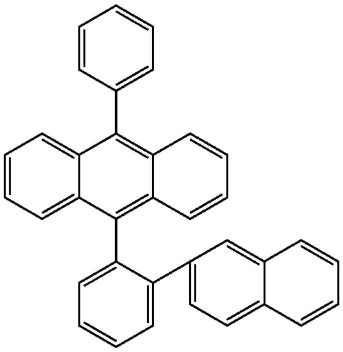
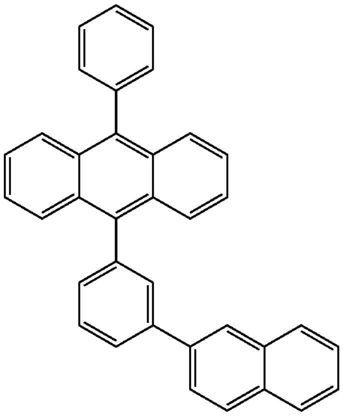
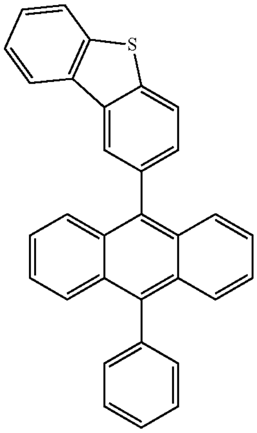
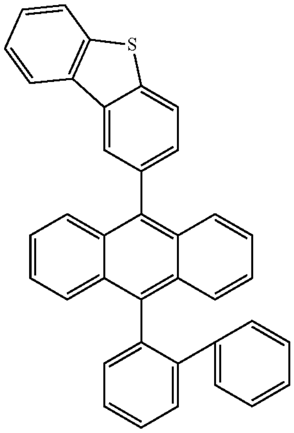

-continued
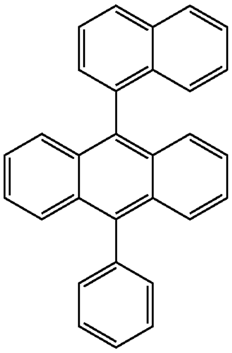
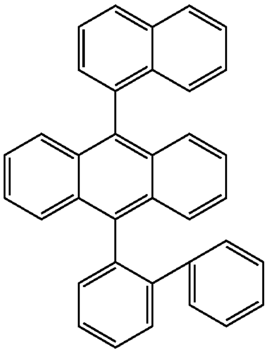
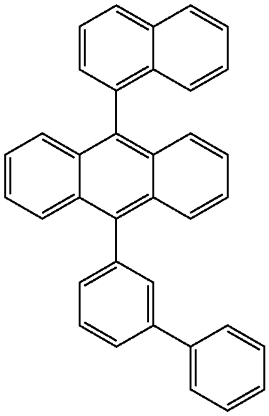
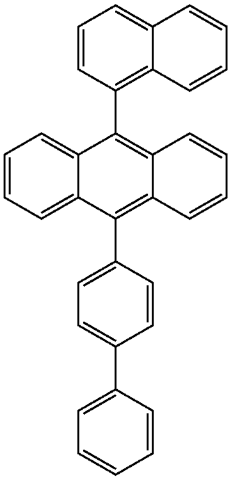
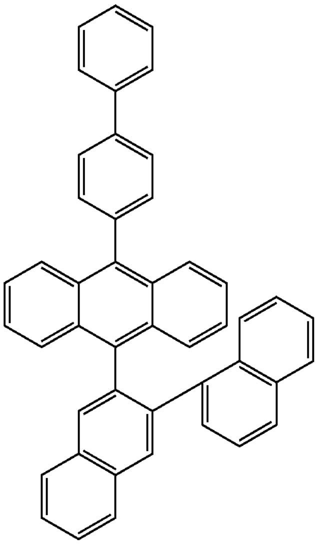
-continued
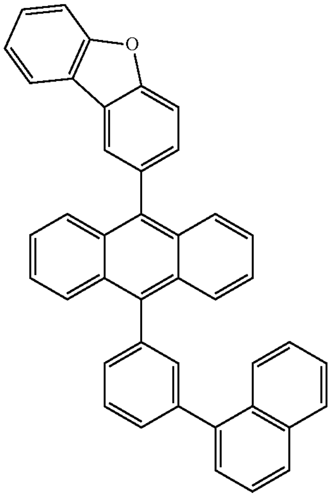
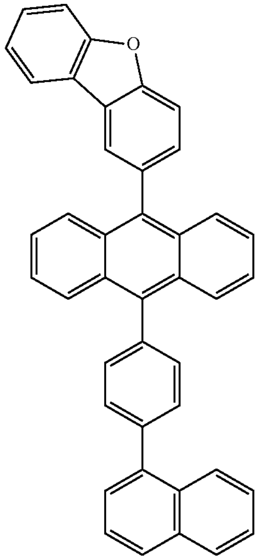
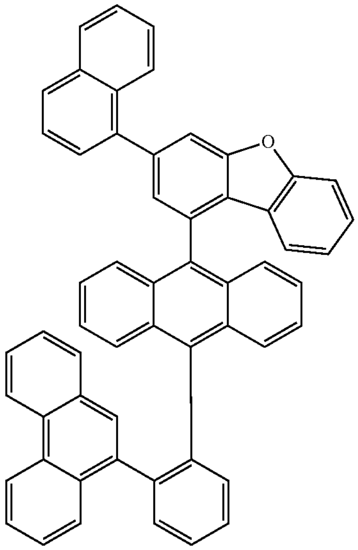

-continued
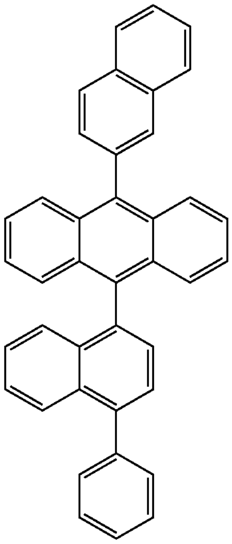
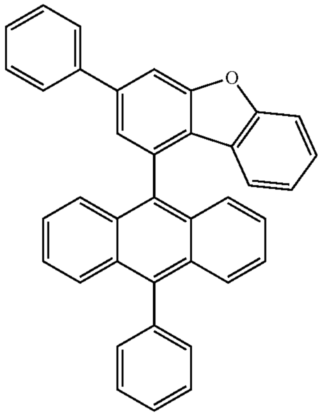
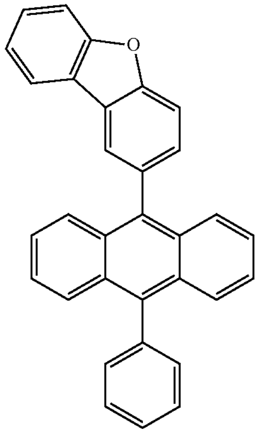
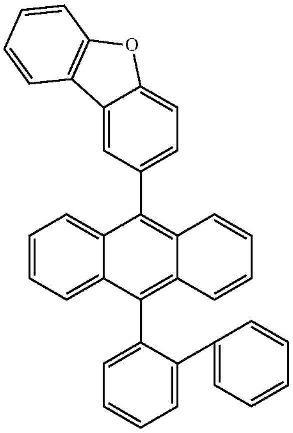
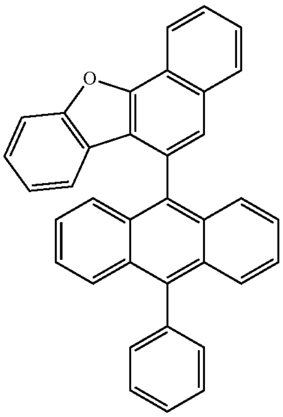
-continued
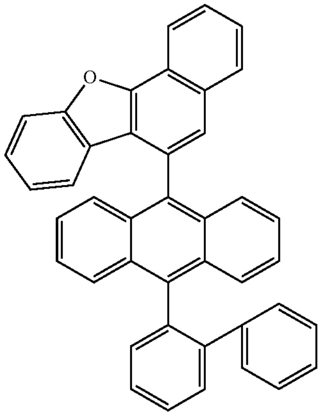
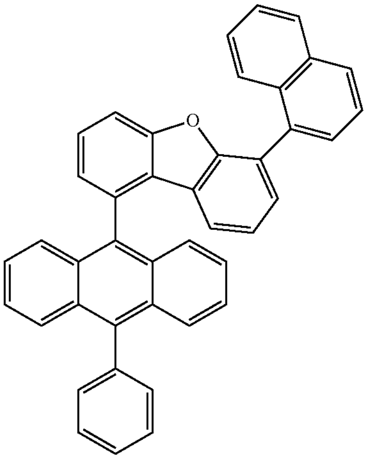
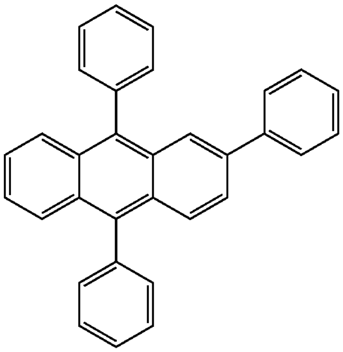
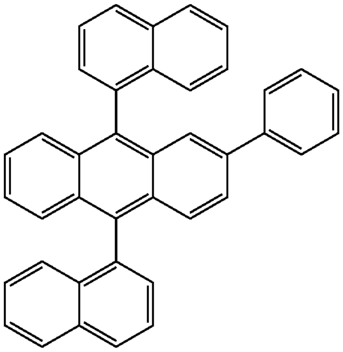

-continued
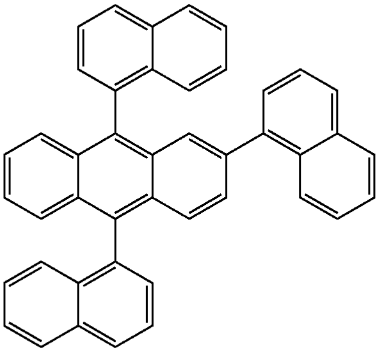
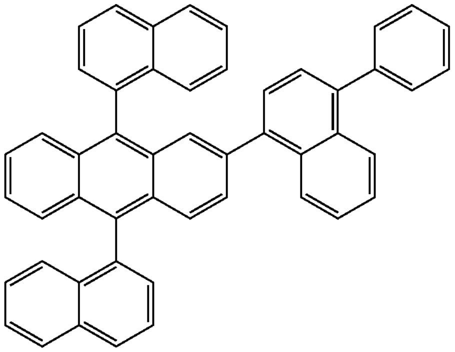
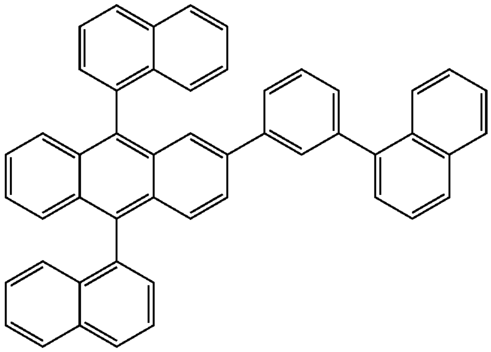
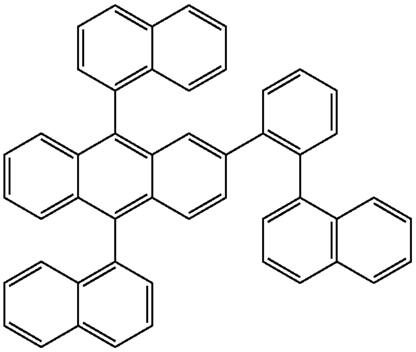
-continued
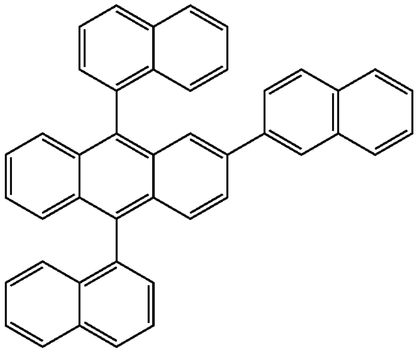
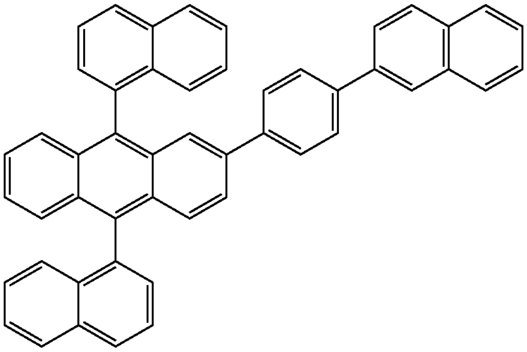
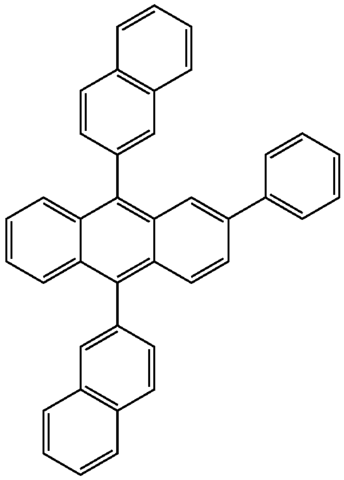
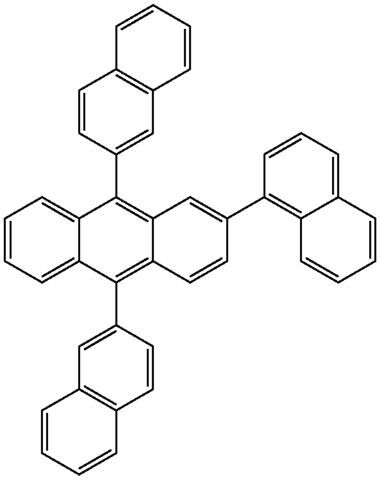

-continued
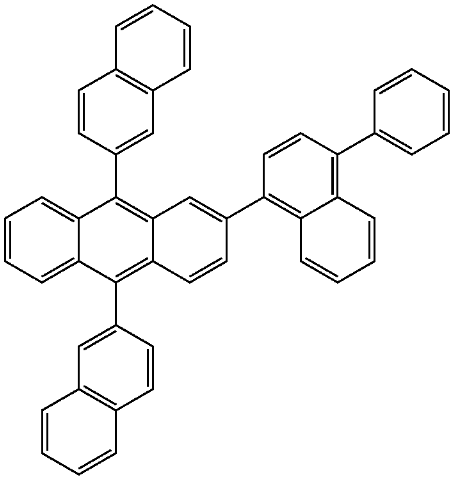
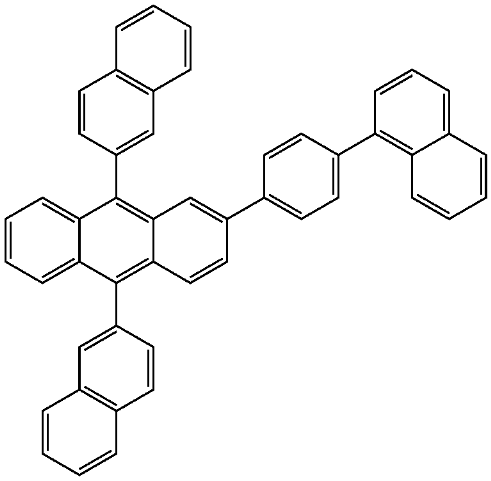
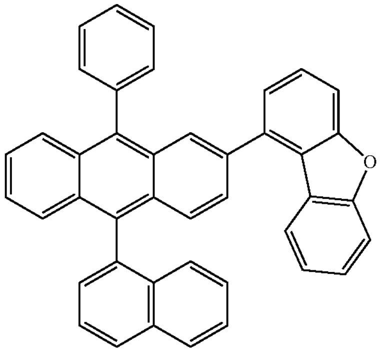
-continued
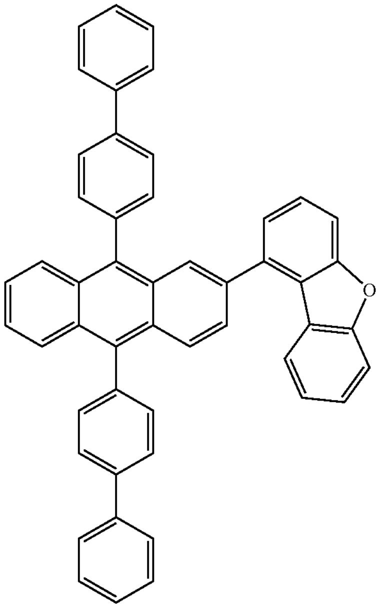
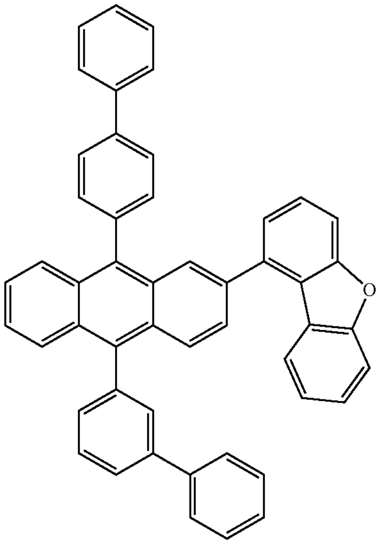
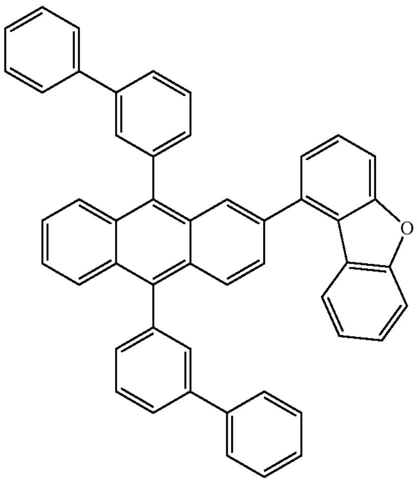

-continued
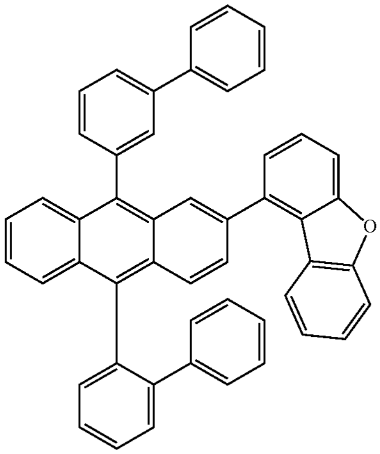
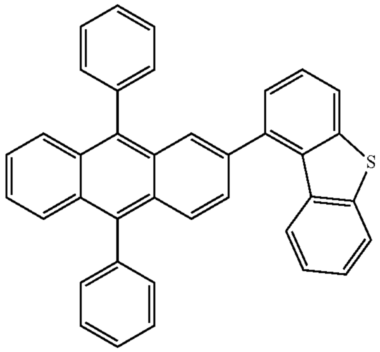
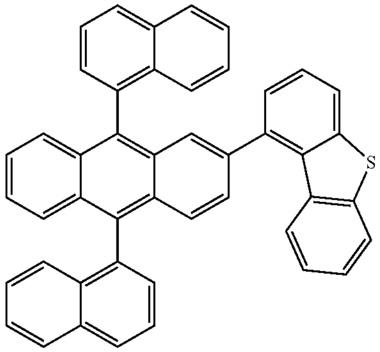
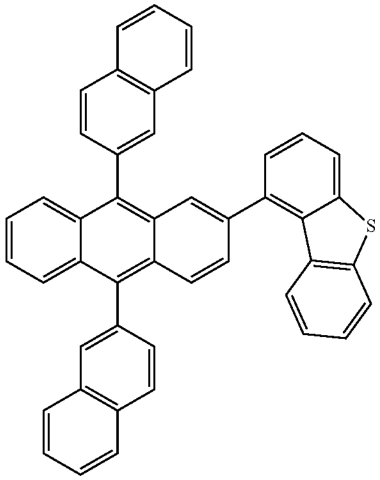
-continued
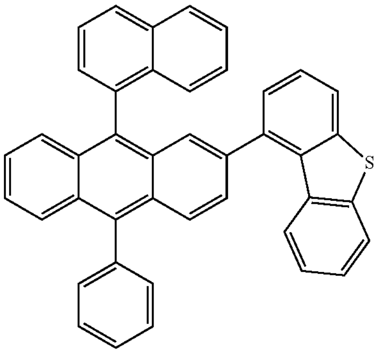
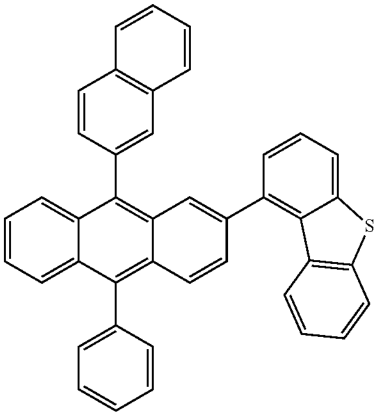
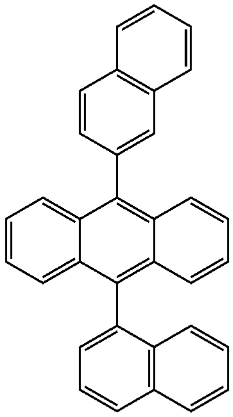
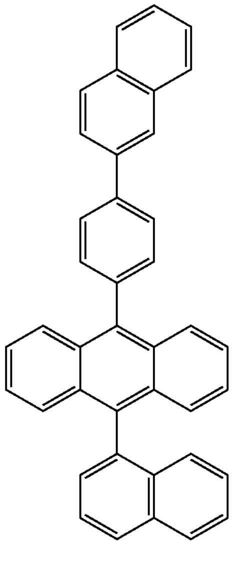

-continued
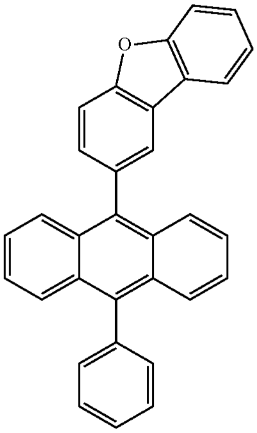
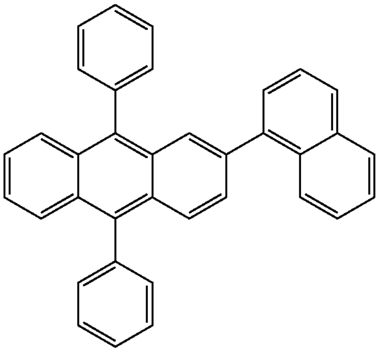
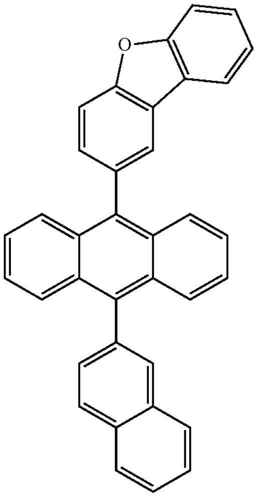
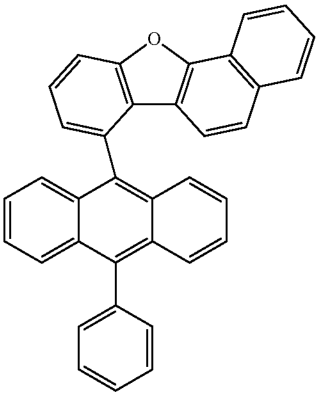
-continued
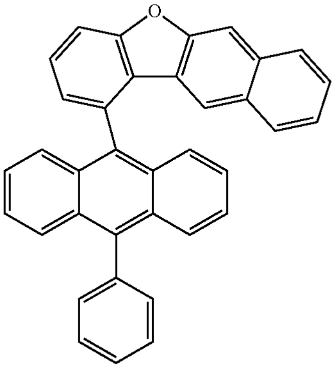
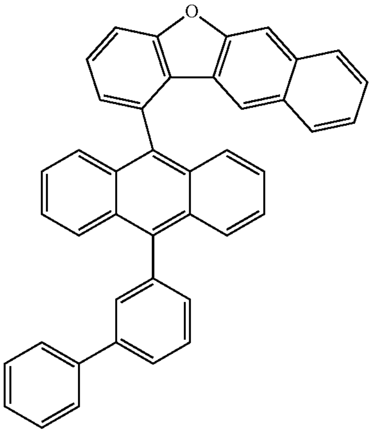
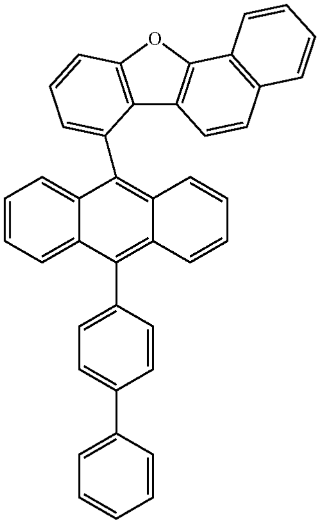

-continued
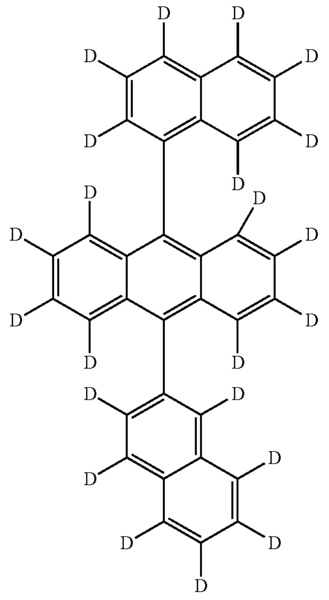
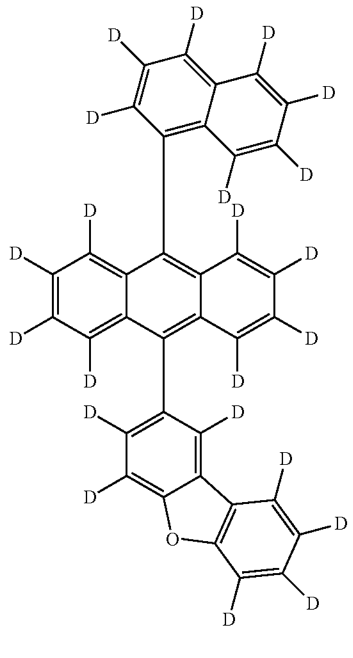
-continued
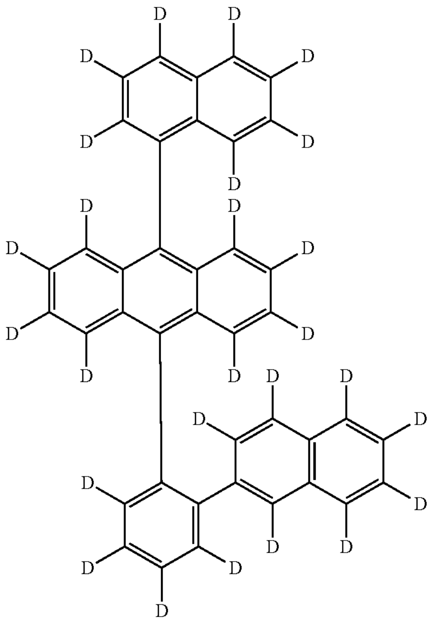
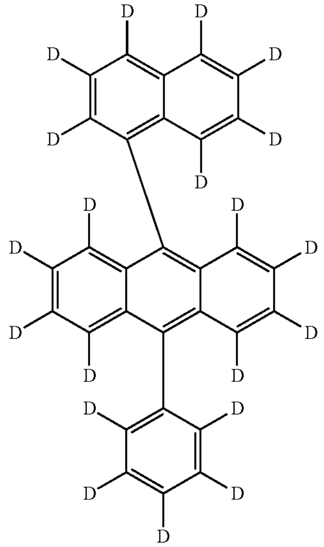
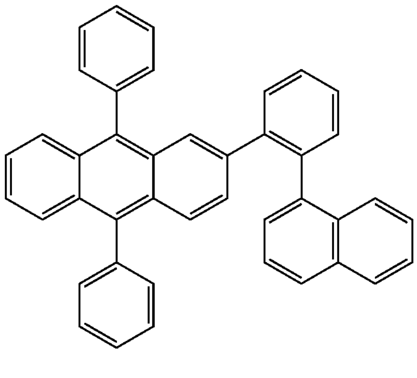

-continued
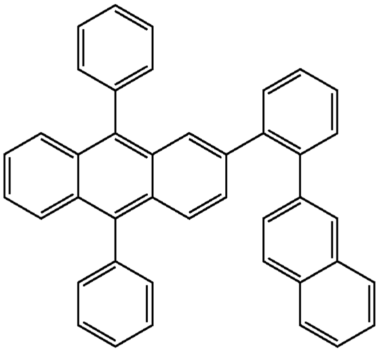
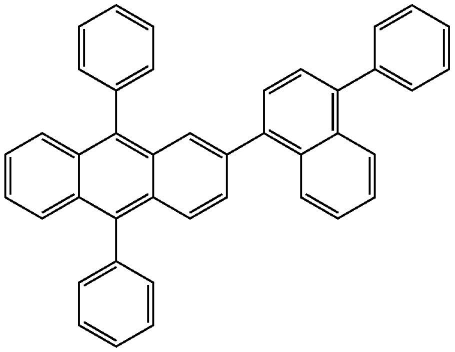
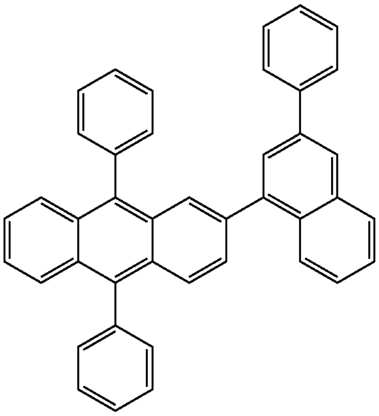
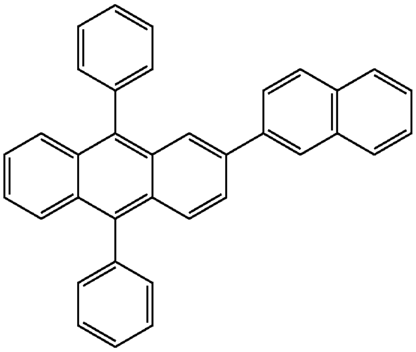
-continued
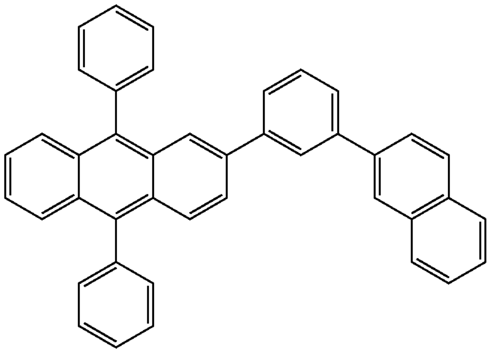
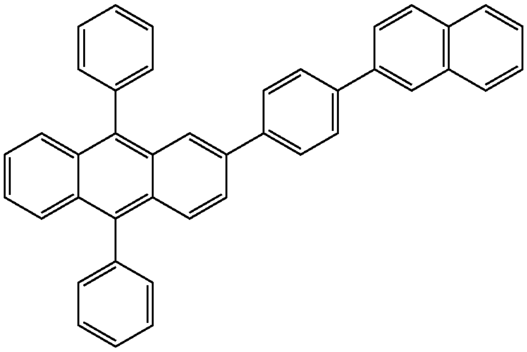
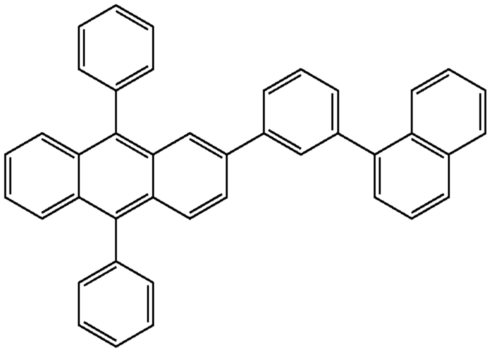
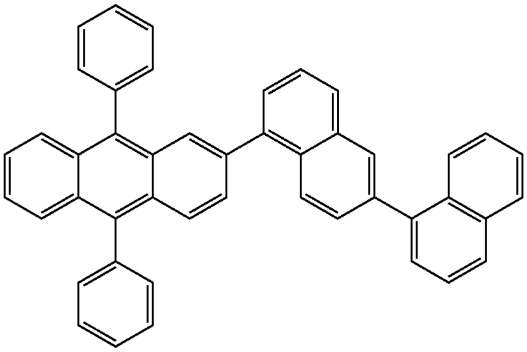

-continued
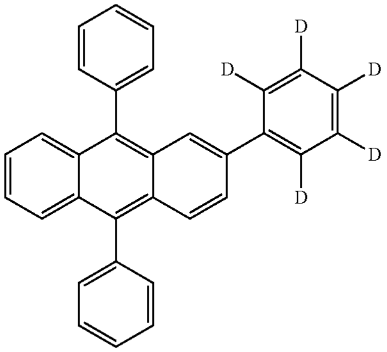
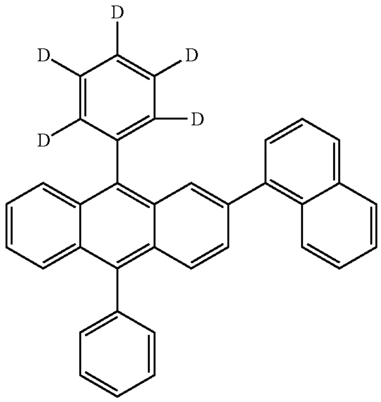
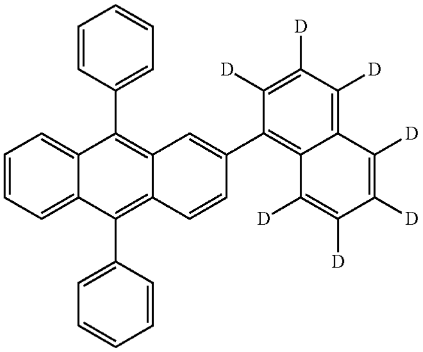
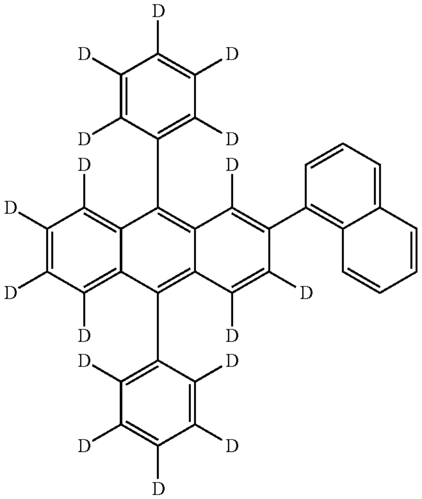
-continued
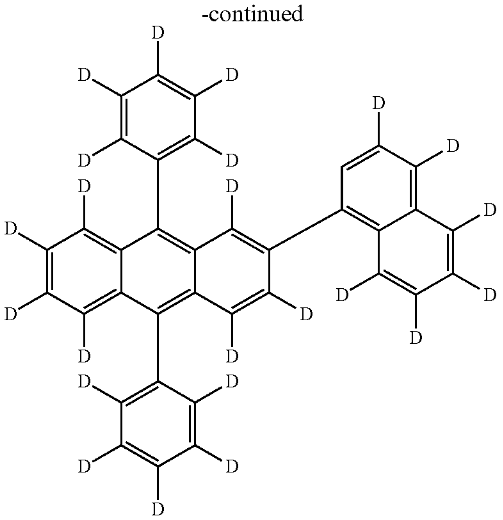
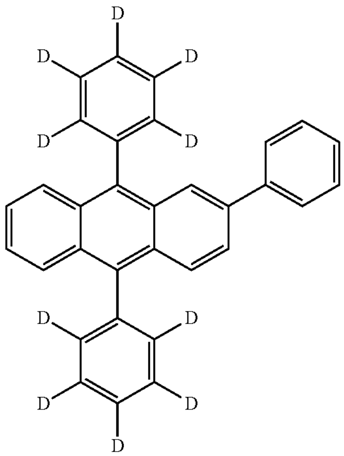
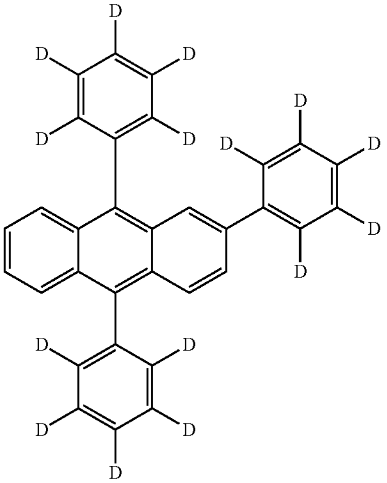

-continued
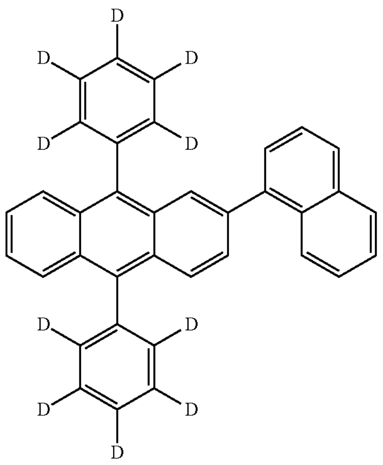
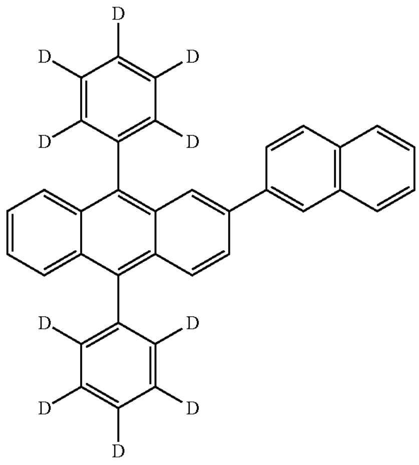
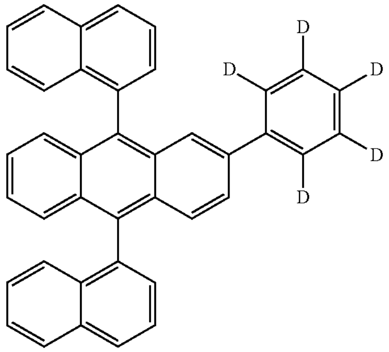
-continued
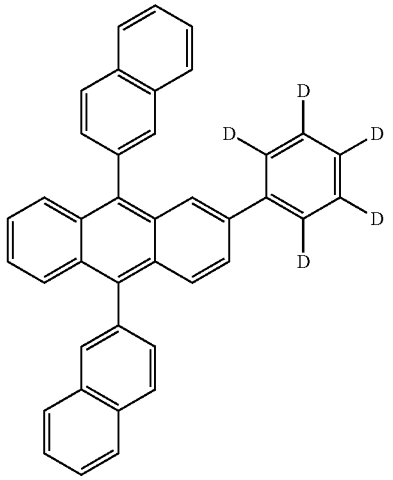
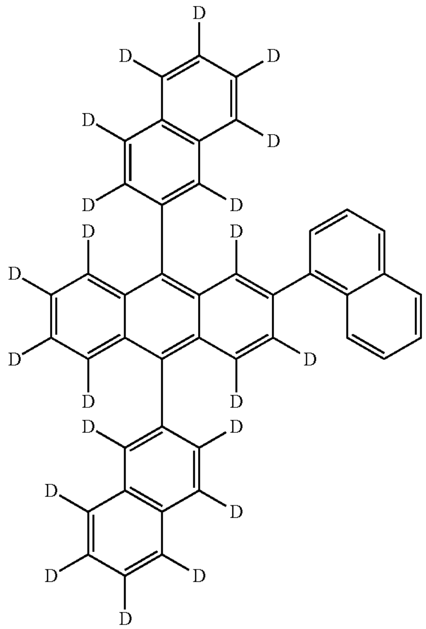
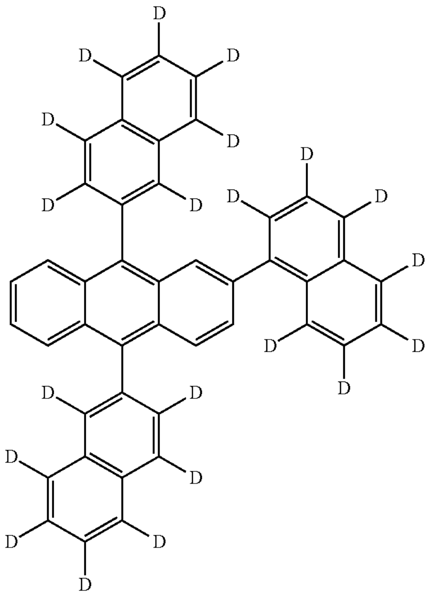

-continued
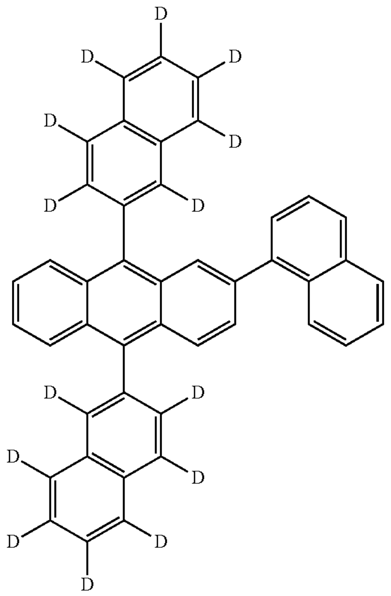
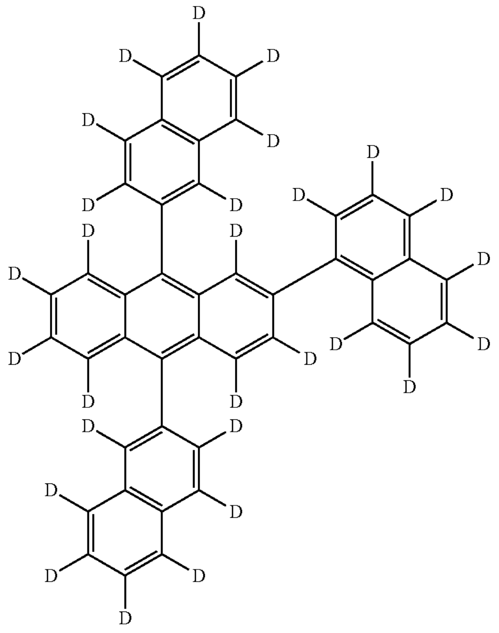
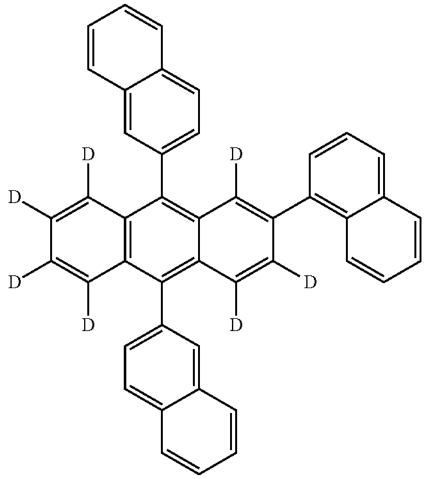
-continued
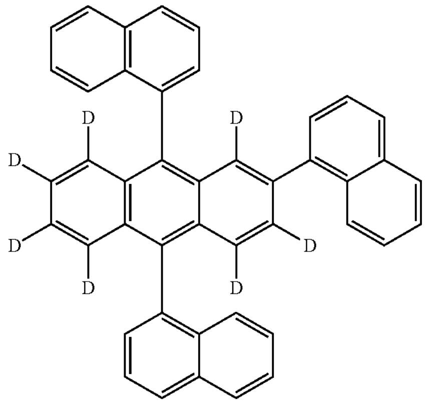
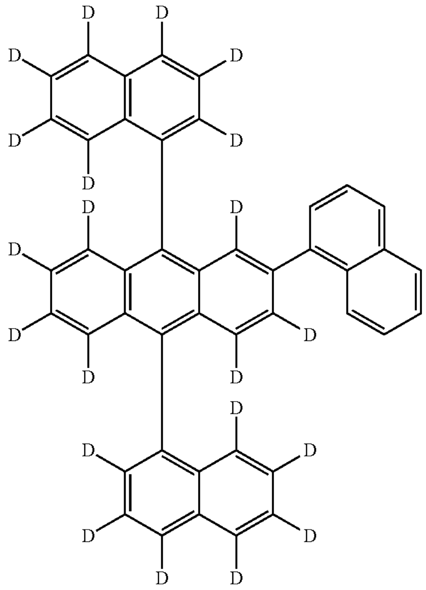
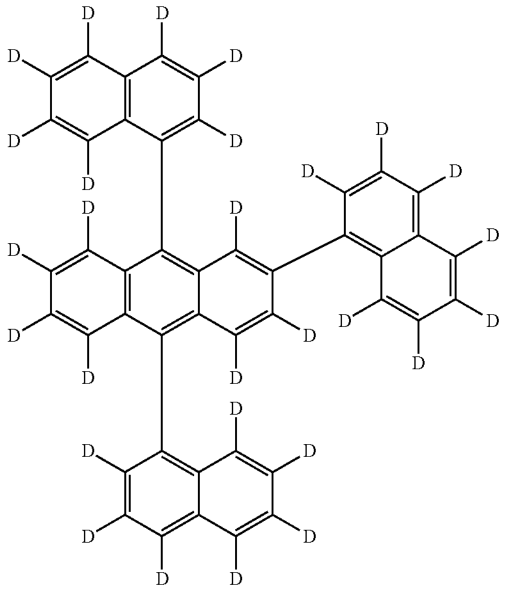

-continued
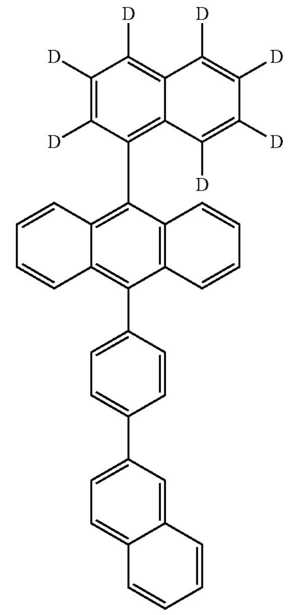
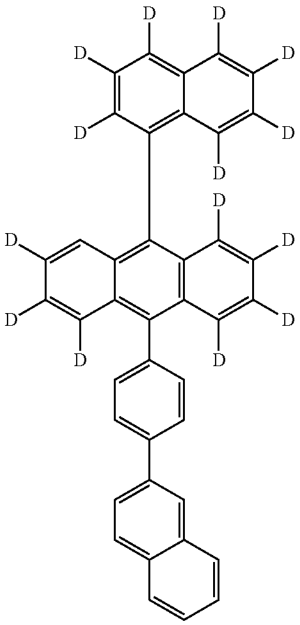
-continued
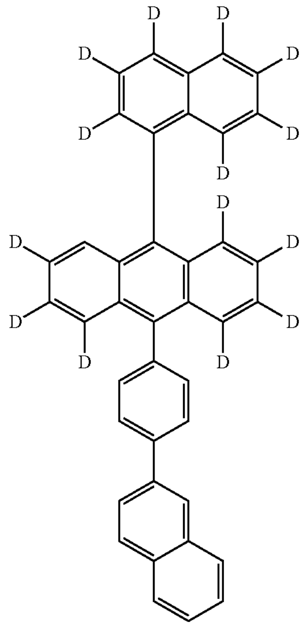
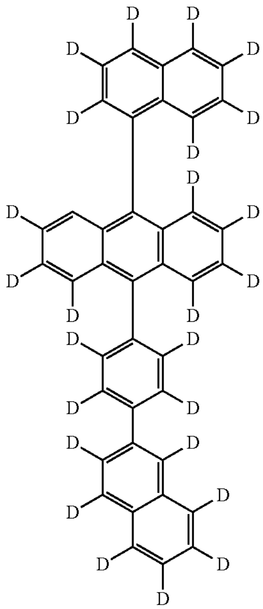
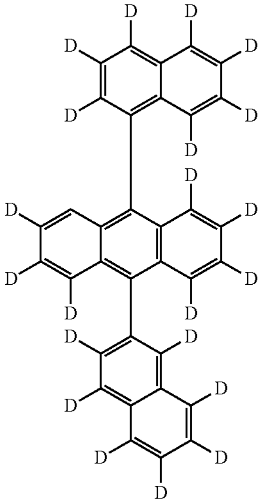

-continued
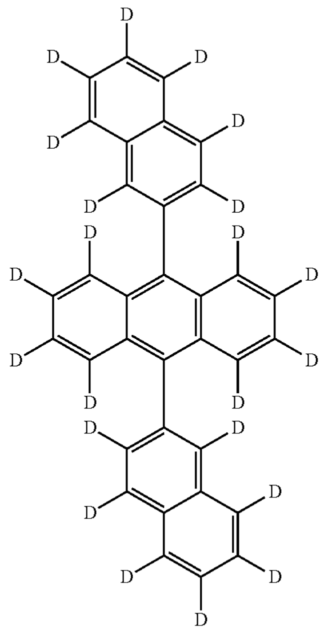
-continued
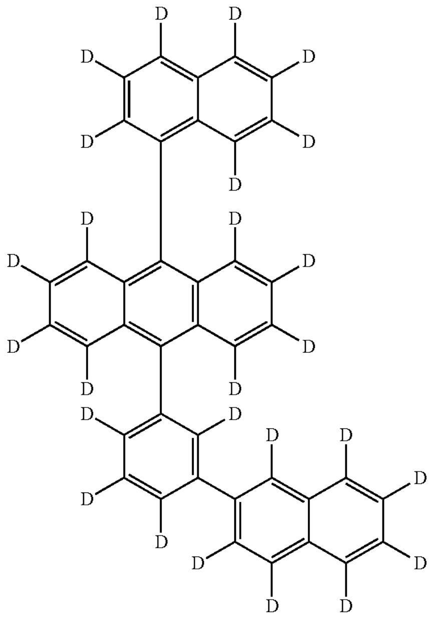
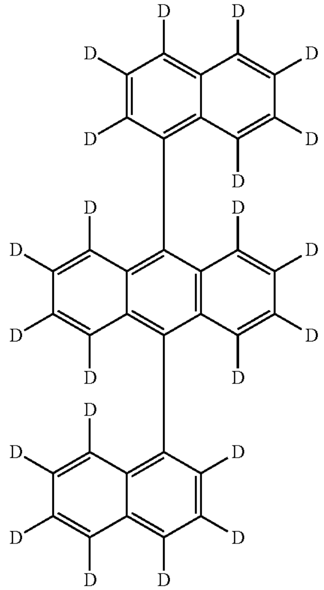
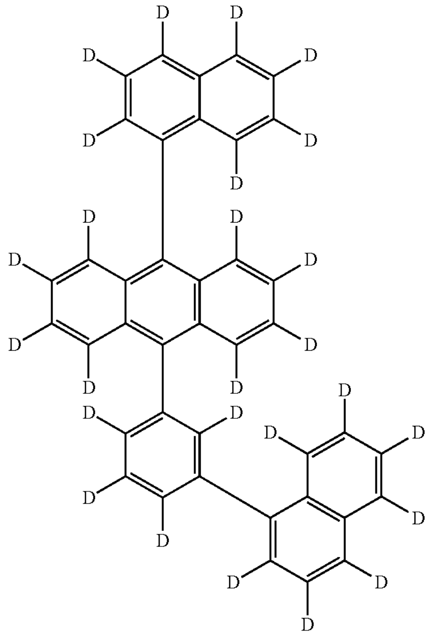

-continued
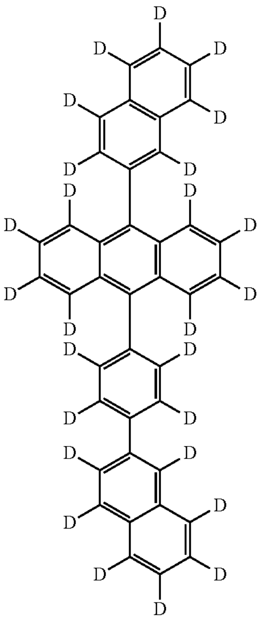
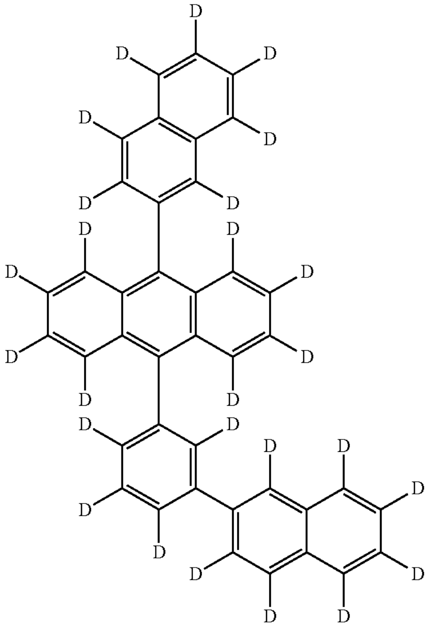
-continued
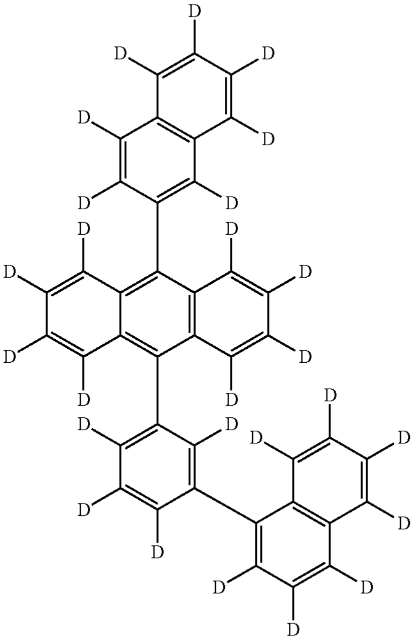
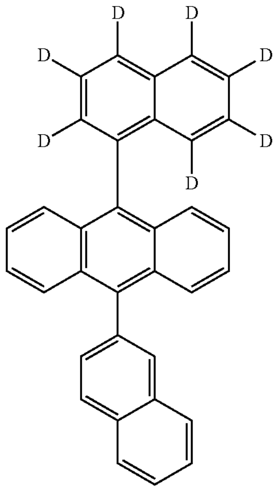
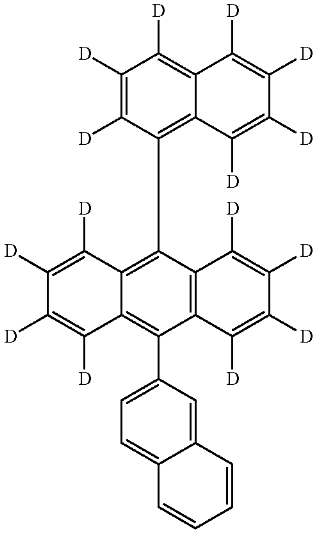

-continued

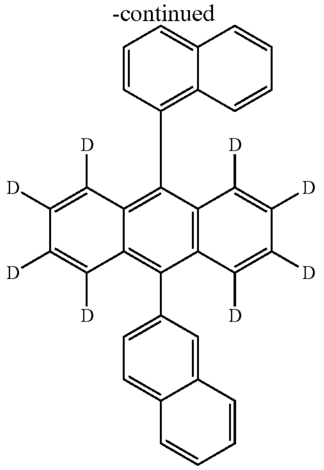

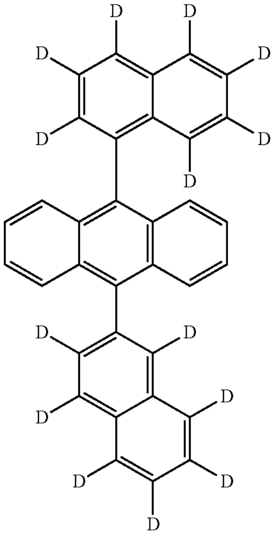

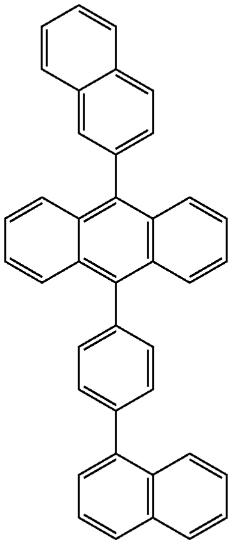

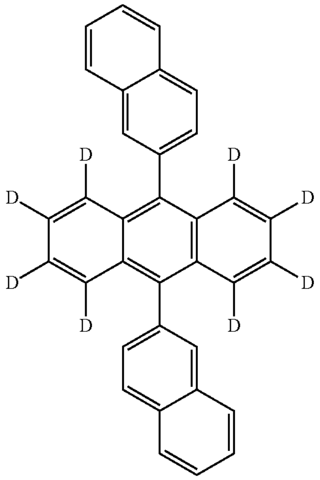

According to another exemplary embodiment, the light emitting layer includes the compound represented by Formula 1 as a dopant, and includes the compound represented by Formula H as a host.

When the light emitting layer includes a dopant and a host, the dopant may be included in an amount of 0.01 to 10 parts by weight based on 100 parts by weight of the host.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device may have, for example, the stacking structure described below, but the stacking structure is not limited thereto.

(1) Positive electrode/Hole transport layer/Light emitting layer/Negative electrode (2) Positive electrode/Hole injection layer/Hole transport layer/Light emitting layer/Negative electrode (3) Positive electrode/Hole transport layer/Light emitting layer/Electron transport layer/Negative electrode (4) Positive electrode/Hole transport layer/Light emitting layer/Electron transport layer/Electron injection layer/Negative electrode (5) Positive electrode/Hole injection layer/Hole transport layer/Light emitting layer/Electron transport layer/Negative electrode (6) Positive electrode/Hole injection layer/Hole transport layer/Light emitting layer/Electron transport layer/Electron injection layer/Negative electrode The structure of the organic light emitting device of the present invention may have a structure illustrated in the FIGURE, but is not limited thereto.

The FIGURE exemplifies a structure of an organic light emitting device in which a positive electrode 2, a hole injection layer 3, a hole transport layer 4, an electron blocking layer 5, a light emitting layer 6, a first electron transport layer 7, a second electron transport layer 8, and a negative electrode 9 are sequentially stacked on a substrate 1. In the structure described above, the compound represented by Formula 1 may be included in the light emitting layer 6.

For example, the organic light emitting device according to the present invention may be manufactured by depositing a metal or a metal oxide having conductivity, or an alloy thereof on a substrate to form a positive electrode, forming an organic material layer having one or more layers selected from the group consisting of a hole injection layer, a hole transport layer, an electron blocking layer, a layer which transports and injects holes simultaneously, a light emitting layer, an electron transport layer, an electron injection layer, a hole blocking layer, and a layer which transports and injects electrons simultaneously, thereon, and then depositing a material, which may be used as a negative electrode, thereon, by using a physical vapor deposition (PVD) method such as sputtering or e-beam evaporation. In addition to the method described above, an organic light emitting device may also be made by sequentially depositing a negative electrode material, an organic material layer, and a positive electrode material on a substrate.

The organic material layer may have a multi-layered structure including a hole injection layer, a hole transport layer, a light emitting layer, and an electron transport layer, and the like, but is not limited thereto and may have a single-layered structure. Further, the organic material layer may be manufactured to include a fewer number of layers by a method such as a solvent process, for example, spin coating, dip coating, doctor blading, screen printing, inkjet printing, or a thermal transfer method, using various polymer materials, instead of a deposition method.

The positive electrode is an electrode which injects holes, and as a positive electrode material, materials having a high work function are usually preferred so as to facilitate the injection of holes into an organic material layer. Specific examples of the positive electrode material which may be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The negative electrode is an electrode which injects electrons, and as a negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from a positive electrode to a light emitting layer, and a hole injection material is preferably a material which may proficiently accept holes from a positive electrode at a low voltage, and the highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transport layer may serve to facilitate the transport of holes. A hole transport material is suitably a material having high hole mobility which may accept holes from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

A hole buffer layer may be additionally provided between the hole injection layer and the hole transport layer, and include hole injection or transport materials known in the art.

An electron blocking layer may be provided between the hole transport layer and the light emitting layer. As the electron blocking layer, a spiroindoloacridine-based compound or a material known in the art may be used.

The light emitting layer may emit red, green, or blue light, and may be composed of a phosphorescent material or a fluorescent material. The light emitting material is a material which may receive holes and electrons from a hole transport layer and an electron transport layer, respectively, and combine the holes and the electrons to emit light in a visible ray region, and is preferably a material having high quantum efficiency for fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene, lubrene, and the like, but are not limited thereto.

Examples of the host material for the light emitting layer include fused aromatic ring derivatives, or hetero ring-containing compounds, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

When the light emitting layer emits red light, it is possible to use a phosphorescent material such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP), or a fluorescent material such as tris(8-hydroxyquinolino)aluminum ($Alq_3$) as a light emitting dopant, but the light emitting dopant is not limited thereto. When the light emitting layer emits green light, it is possible to use a phosphorescent material such as fac tris(2-phenylpyridine)iridium ($Ir(ppy)_3$), or a fluorescent material such as tris(8-hydroxyquinolino)aluminum ($Alq_3$), as the light emitting dopant, but the light emitting dopant is not limited thereto. When the light emitting layer emits blue light, it is possible to use a phosphorescent material such as $(4,6-F_2ppy)_2Irpic$, or a fluorescent material such as spiro-DPVBi, spiro-6P, distyryl benzene (DSB), distyryl arylene (DSA), a PFO-based polymer or a PPV-based polymer as the light emitting dopant, but the light emitting dopant is not limited thereto.

The electron transport layer may serve to facilitate the transport of electrons. An electron transport material is suitably a material having high electron mobility which may proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes; 8-quinolinolato lithium (LiQ); benzoimidazole-based compounds; or a combination thereof, and the like, but are not limited thereto. Further, the electron transport layer may be formed of one layer, but may be formed of two or more layers.

The electron injection layer may serve to facilitate the injection of electrons. An electron injection material is preferably a compound which has a capability of transporting electrons, an effect of injecting electrons from a negative electrode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h]

quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and may be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention may be a top emission type, a bottom emission type, or a dual emission type according to the material to be used.

MODE FOR INVENTION

Synthesis Examples

Synthesis Example 1. Synthesis of Compound 1

1) Synthesis of Intermediate 1

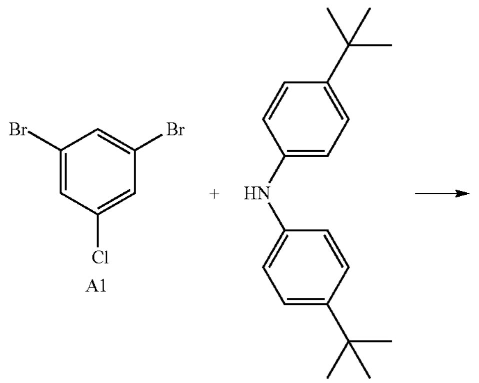

A1

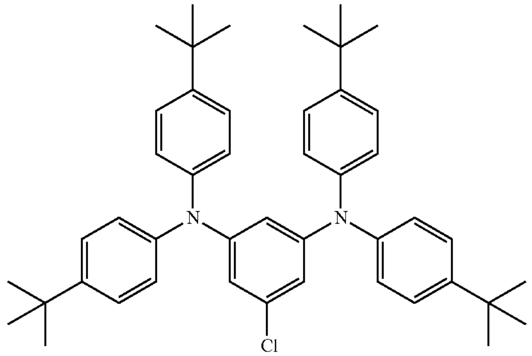

1

After 20 g of 1,3-dibromo-5-chlorobenzene, 41.6 g of bis(4-(tert-butyl)phenyl)amine, 35.5 g of sodium-tert-butoxide, and 0.4 g of bis(tri-tert-butylphosphine)palladium(0) were put into 300 ml of toluene under a nitrogen atmosphere, the resulting mixture was stirred under reflux for 2 hours. After the completion of the reaction, the resulting product was extracted, and then recrystallized to obtain 35 g of Intermediate 1. (yield 70%). MS[M+H]+=672

2) Synthesis of Intermediate 2

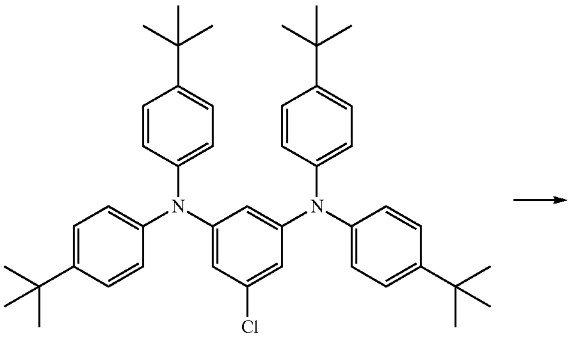

1

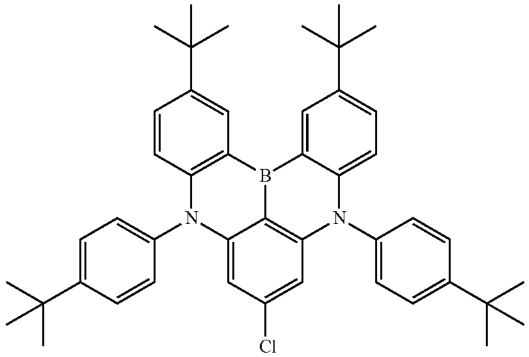

2

After 25 g of Intermediate 2 and 24.8 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 2 (yield 29%). MS[M+H]+=680

3) Synthesis of Compound 1

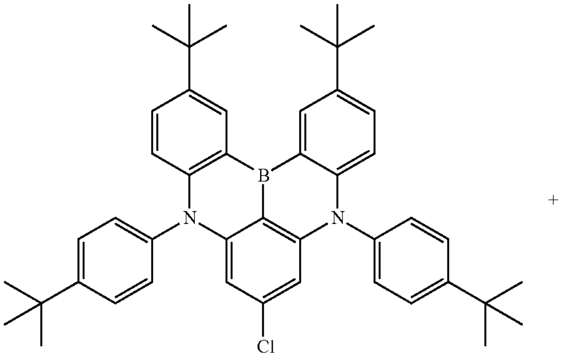

2

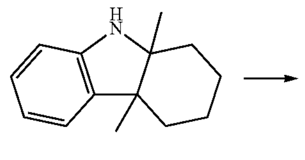

-continued

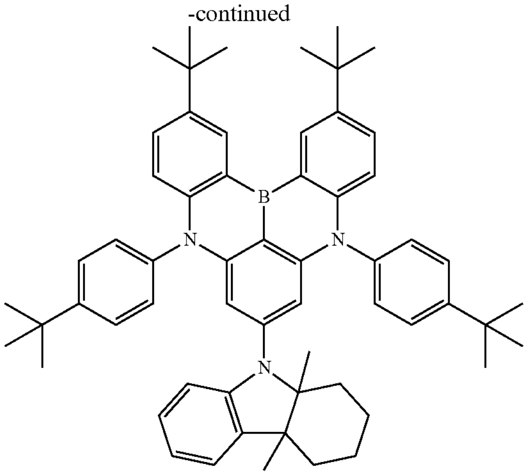

C-1

After 7 g of Intermediate 2, 2.1 g of 4a,9a-dimethyl-2,3,4,4a,9,9a-hexahydro-1H-carbazole, 2.0 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.8 g of Compound 1 (C-1). (yield 78%). MS[M+H]+=845

Synthesis Example 2. Synthesis of Compound 2

1) Synthesis of Intermediate 3

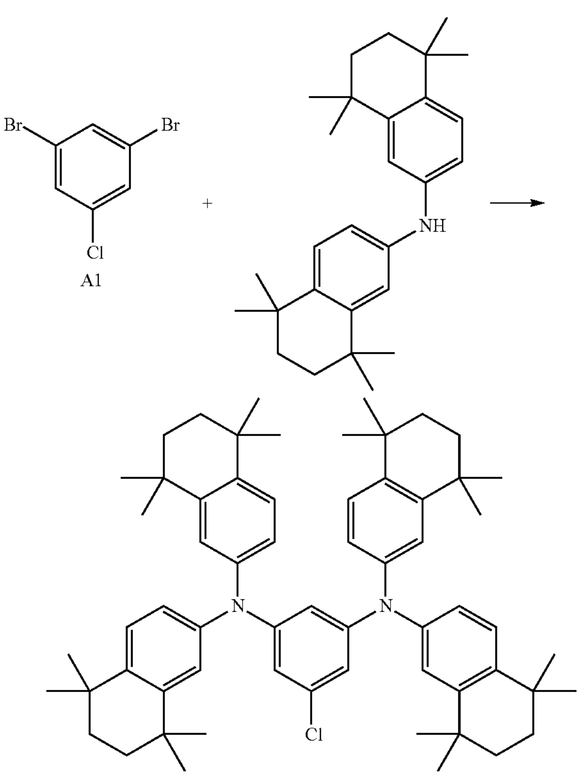

A1

3

After 20 g of A1, 57.6 g of bis(5,5,8,8-tetramethyl-5,6,7,8-tetrahydronaphthalen-2-yl)amine, 35.5 g of sodium-tert-butoxide, and 0.4 g of bis(tri-tert-butylphosphine)palladium (0) were put into 300 ml of toluene under a nitrogen atmosphere, the resulting mixture was stirred under reflux for 2 hours. After the completion of the reaction, the resulting product was extracted, and then recrystallized to obtain 52 g of Intermediate 3. (yield 79%). MS[M+H]+=888

2) Synthesis of Intermediate 4

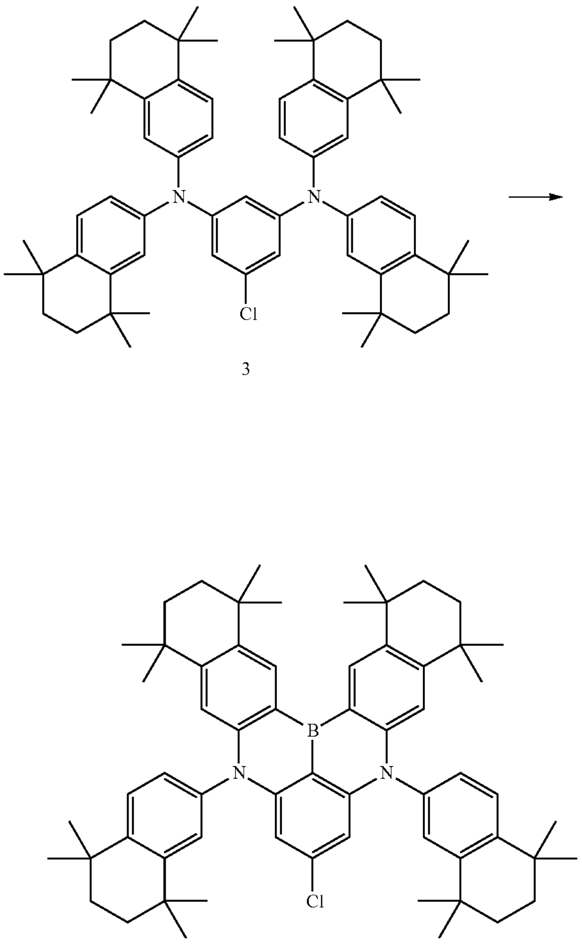

3

4

After 25 g of Intermediate 3 and 18.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 4 (yield 31%). MS[M+H]+=896

3) Synthesis of Compound 2

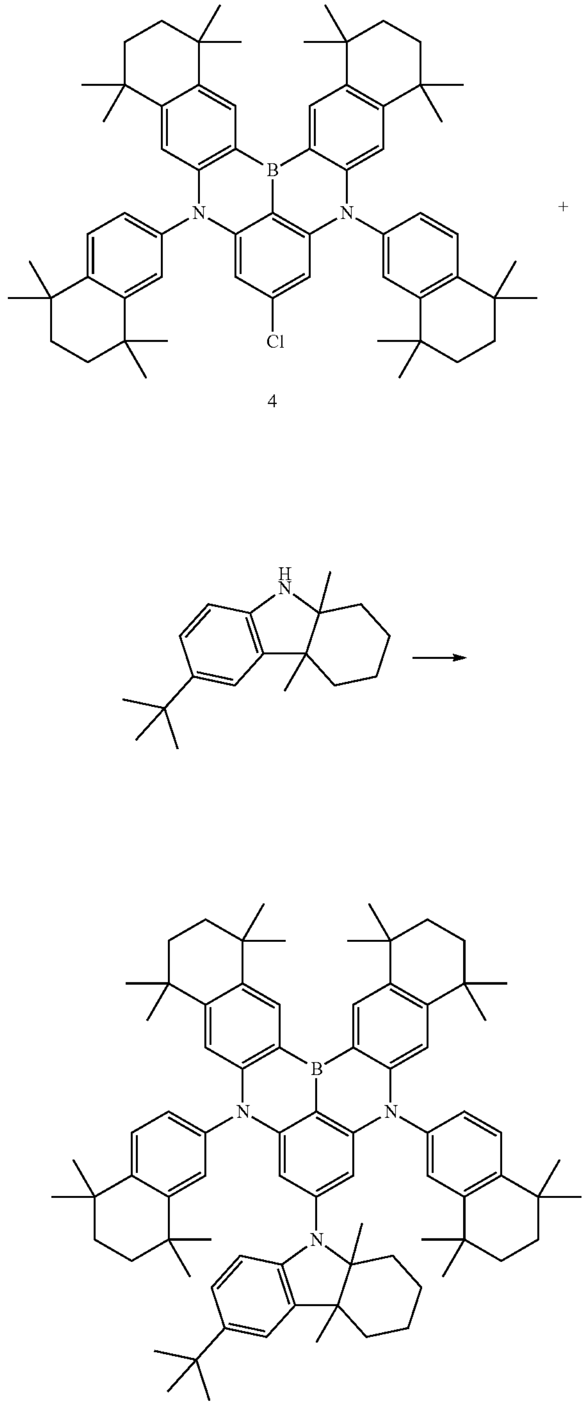

4

C-2

After 7 g of Intermediate 4, 2.1 g of 6-(tert-butyl)-4a,9a-dimethyl-2,3,4,4a,9,9a-hexahydro-1H-carbazole, 1.6 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.4 g of Compound 2 (C-2). (yield 73%). MS[M+H]+=1117

Synthesis Example 3. Synthesis of Compound 3

1) Synthesis of Compound 3

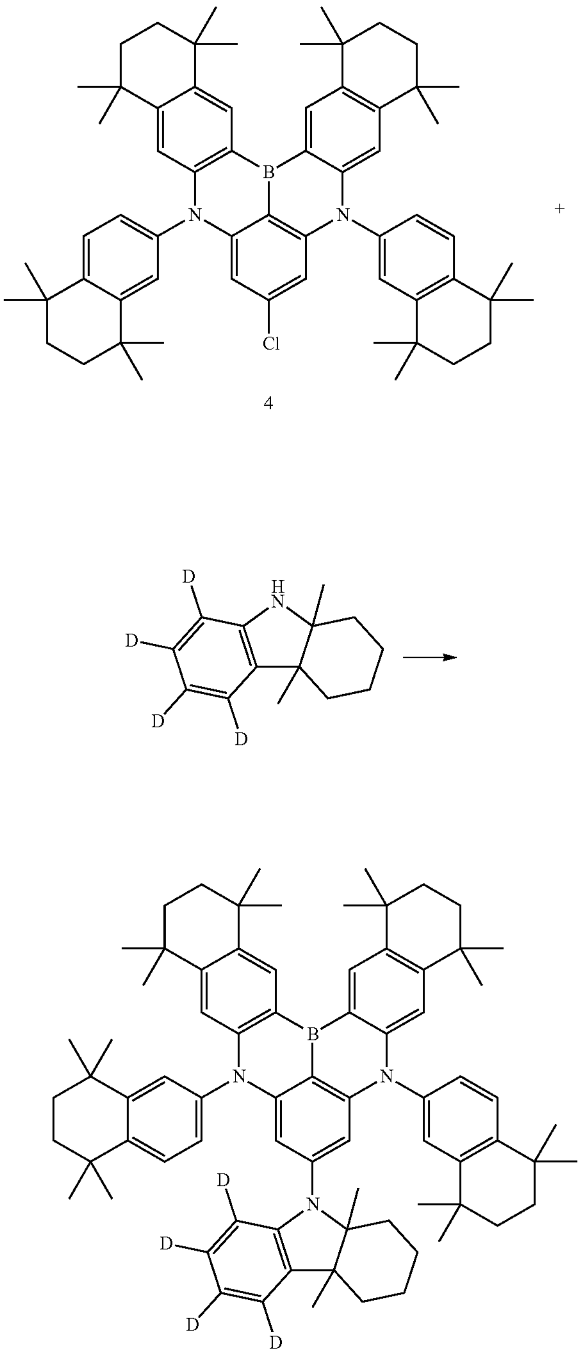

4

C-3

After 7 g of Intermediate 4, 1.6 g of 4a,9a-dimethyl-2,3,4,4a,9,9a-hexahydro-1H-carbazole-5,6,7,8-d4, 1.6 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.5 g of Compound 3 (C-3). (yield 78%). MS[M+H]+=1065

Synthesis Example 4. Synthesis of Compound 4

1) Synthesis of Intermediate 5

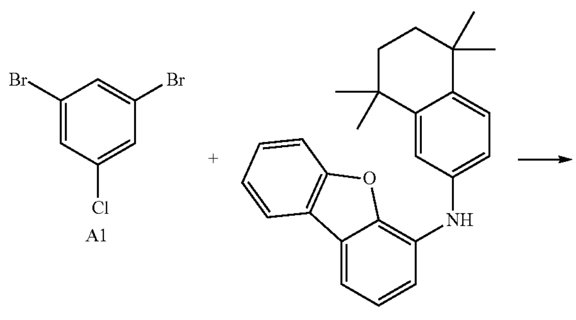

A1

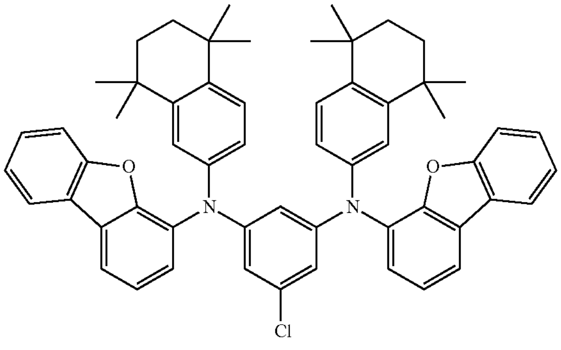

5

After 20 g of A1, 54.7 g of N-(5,5,8,8-tetramethyl-5,6,7,8-tetrahydronaphthalen-2-yl)dibenzo[b,d]furan-4-amine, 35.5 g of sodium-tert-butoxide, and 0.4 g of bis(tri-tert-butylphosphine)palladium(0) were put into 300 ml of toluene under a nitrogen atmosphere, the resulting mixture was stirred under reflux for 2 hours. After the completion of the reaction, the resulting product was extracted, and then recrystallized to obtain 45 g of Intermediate 5. (yield 72%). MS[M+H]+=848

2) Synthesis of Intermediate 6

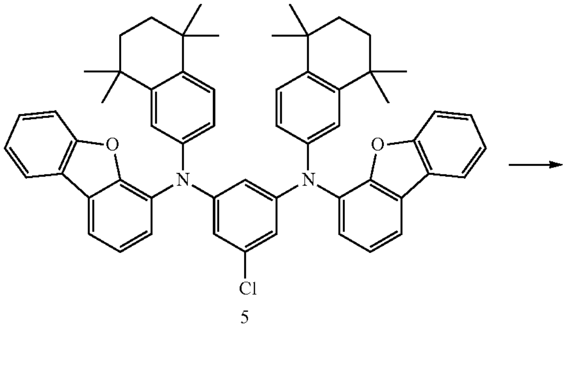

5

-continued

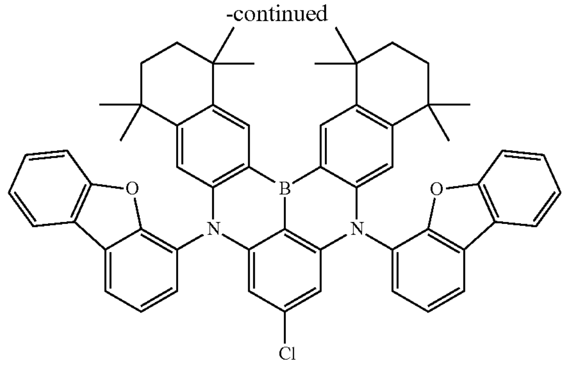

6

After 25 g of Intermediate 5 and 19.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 6 (yield 29%). MS[M+H]+=856

3) Synthesis of Compound 4

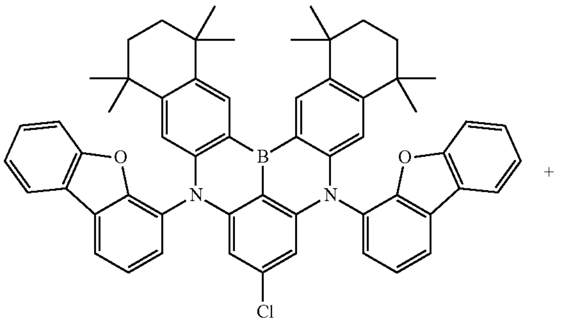

6

+

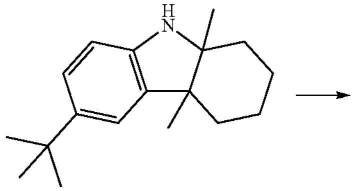

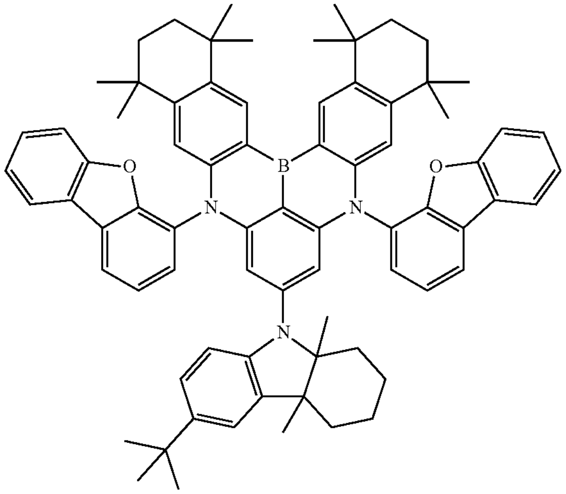

C-4

After 7 g of Intermediate 6, 2.1 g of 6-(tert-butyl)-4a,9a-dimethyl-2,3,4,4a,9,9a-hexahydro-1H-carbazole, 1.6 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 4 (C-4). (yield 75%). MS[M+H]+=1077

Synthesis Example 5. Synthesis of Compound 5

1) Synthesis of Intermediate 7

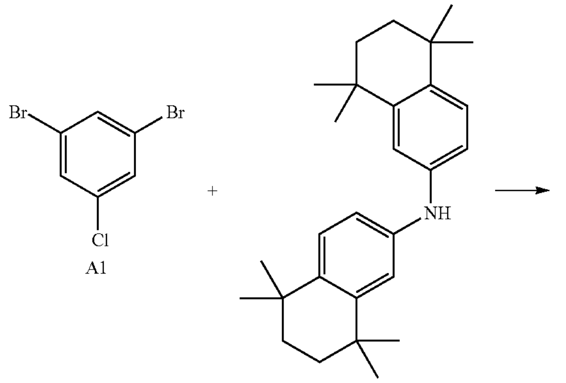

A1

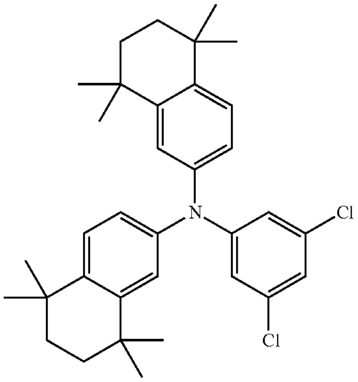

7

After 40 g of A6, 69 g of bis(5,5,8,8-tetramethyl-5,6,7,8-tetrahydronaphthalen-2-yl)amine, 34.1 g of sodium-tert-butoxide, and 0.9 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 70 g of Intermediate 7. (yield 74%). MS[M+H]+=535

2) Synthesis of Intermediate 8

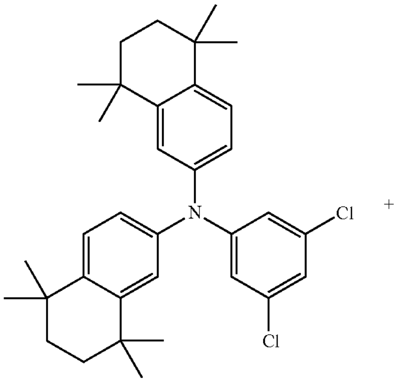

7

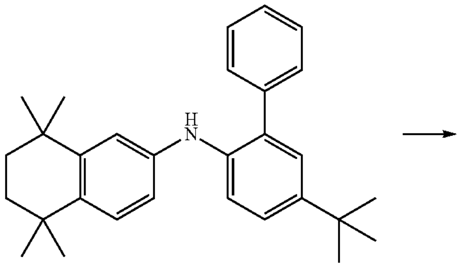

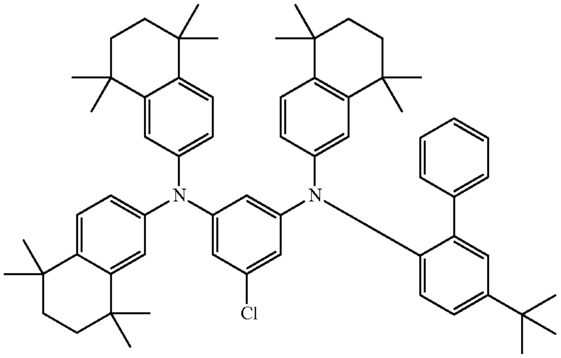

8

After 40 g of Intermediate 7, 30.8 g of N-(5-(tert-butyl)-[1,1'-biphenyl]-2-yl)-5,5,8,8-tetramethyl-5,6,7,8-tetrahydronaphthalen-2-amine, 18.0 g of sodium-tert-butoxide, and 0.4 g of bis(tri-tert-butylphosphine)palladium(0) were put into 600 ml of toluene under a nitrogen atmosphere, the resulting mixture was stirred under reflux for 4 hours. After the completion of the reaction, the resulting product was extracted, and then recrystallized to obtain 50 g of Intermediate 8. (yield 73%). MS[M+H]+=910

3) Synthesis of Intermediate 9

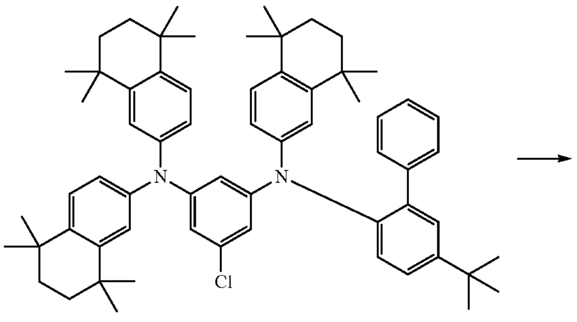

8

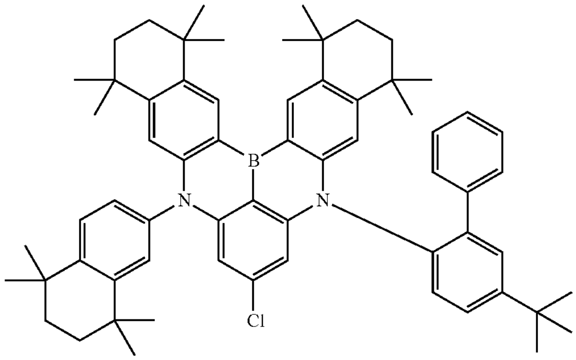

9

After 25 g of Intermediate 8 and 18.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Intermediate 9 (yield 30%). MS[M+H]+=918

4) Synthesis of Compound 5

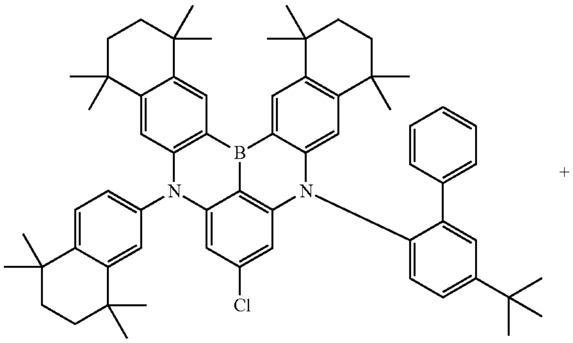

9

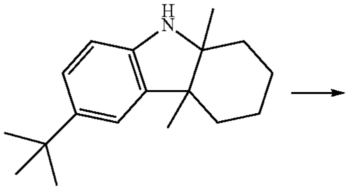

-continued

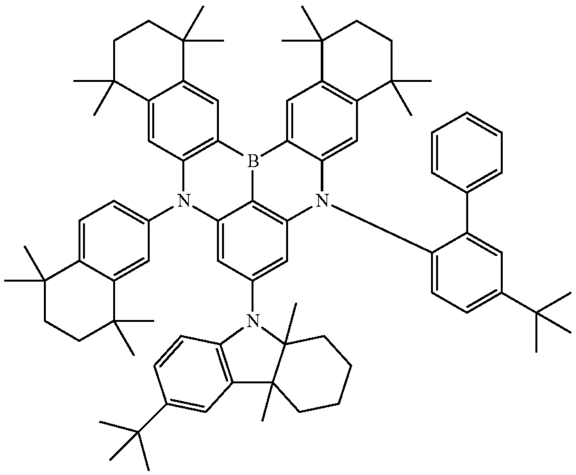

C-5

After 7 g of Intermediate 9, 2.0 g of 6-(tert-butyl)-4a,9a-dimethyl-2,3,4,4a,9,9a-hexahydro-1H-carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.9 g of Compound 5 (C-5). (yield 79%). MS[M+H]+=1139

Synthesis Example 6. Synthesis of Compound 6

1) Synthesis of Intermediate 10

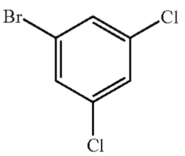

A6

+

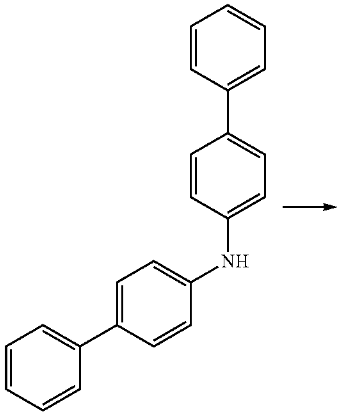

-continued

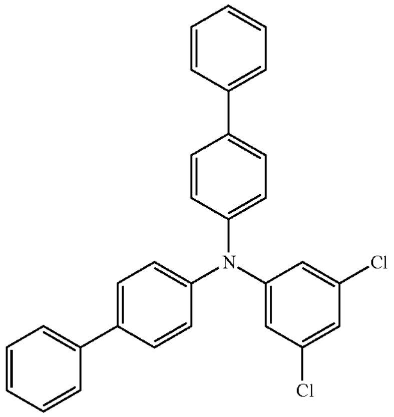

10

After 40 g of A6, 57 g of di([1,1'-biphenyl]-4-yl)amine, 34.1 g of sodium-tert-butoxide, and 0.9 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 65 g of Intermediate 10. (Yield 79%). MS[M+H]+=467

2) Synthesis of Intermediate 11

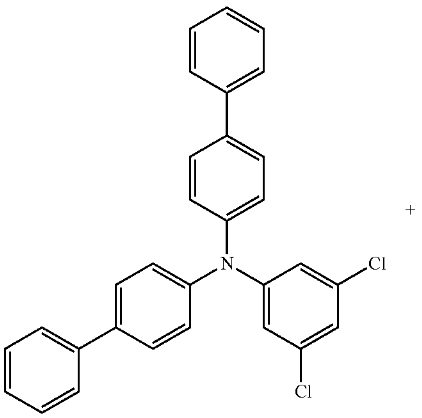

10

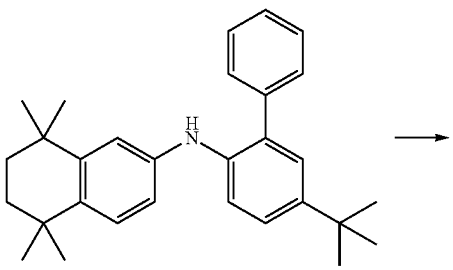

-continued

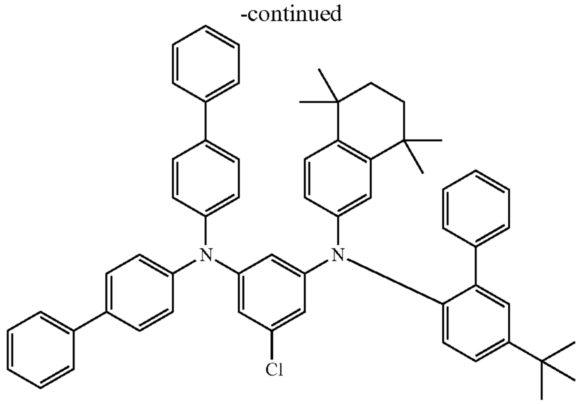

11

After 40 g of Intermediate 10, 35.3 g of N-(5-(tert-butyl)-[1,1'-biphenyl]-2-yl)-5,5,8,8-tetramethyl-5,6,7,8-tetrahydronaphthalen-2-amine, 20.6 g of sodium-tert-butoxide, and 0.4 g of bis(tri-tert-butylphosphine)palladium(0) were put into 600 ml of toluene under a nitrogen atmosphere, the resulting mixture was stirred under reflux for 4 hours. After the completion of the reaction, the resulting product was extracted, and then recrystallized to obtain 55 g of Intermediate 11. (yield 76%). MS[M+H]+=842

3) Synthesis of Intermediate 12

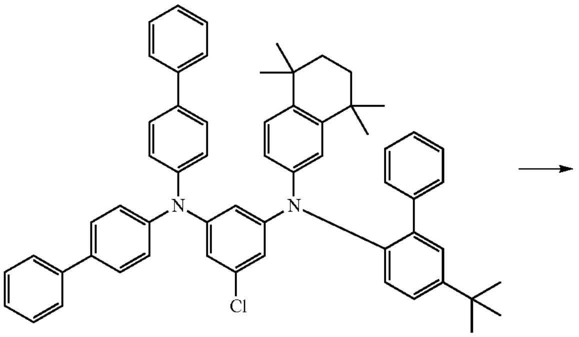

11

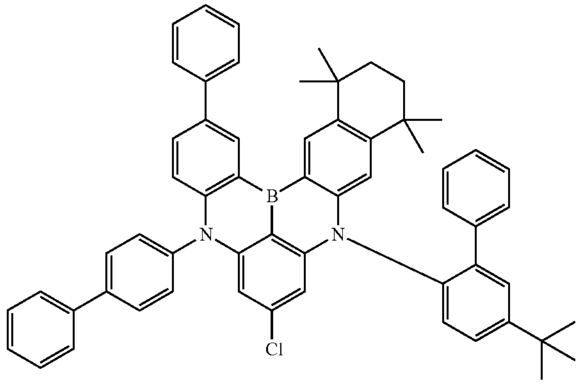

12

After 25 g of Intermediate 11 and 19.8 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 12 (yield 30%). MS[M+H]+ =850

4) Synthesis of Compound 6

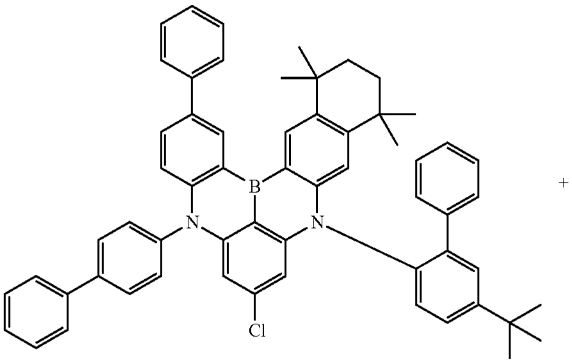

12

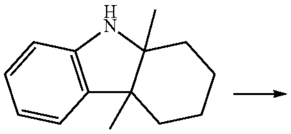

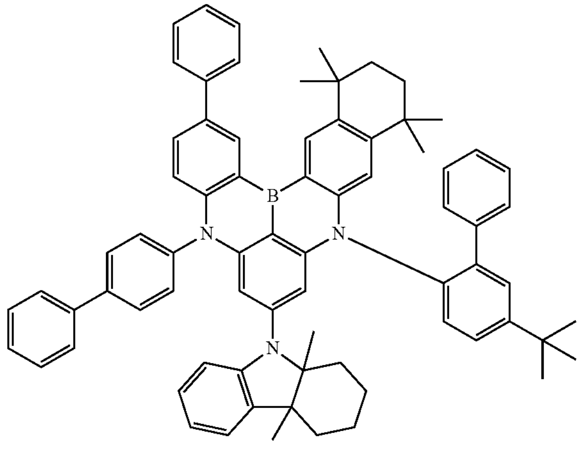

C-6

After 7 g of Intermediate 12, 1.7 g of 4a,9a-dimethyl-2,3,4,4a,9,9a-hexahydro-1H-carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.3 g of Compound 6 (C-6). (yield 75%). MS[M+H]+=1015

Synthesis Example 7. Synthesis of Compound 7

1) Synthesis of Intermediate 13

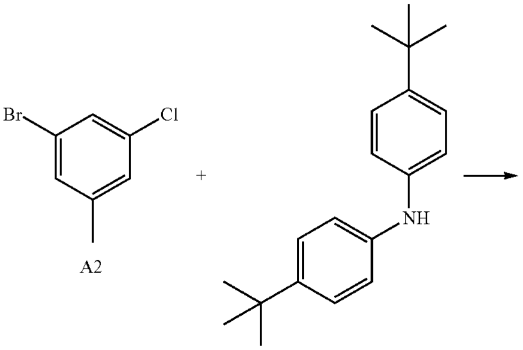

A2

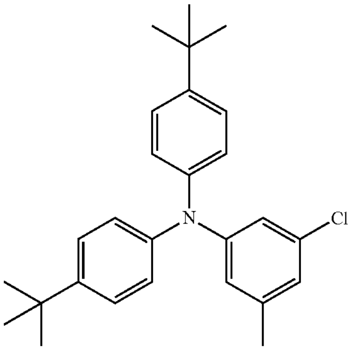

13

After 40 g of 1-bromo-3-chloro-5-methylbenzene, 55 g of bis(4-(tert-butyl)phenyl)amine, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 62 g of Intermediate 13. (yield 78%). MS[M+H]+=407

2) Synthesis of Intermediate 14

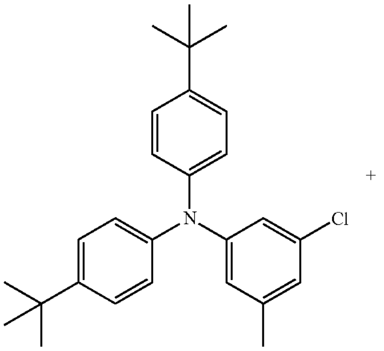

13

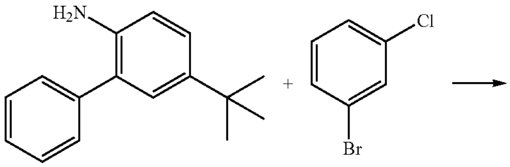

-continued

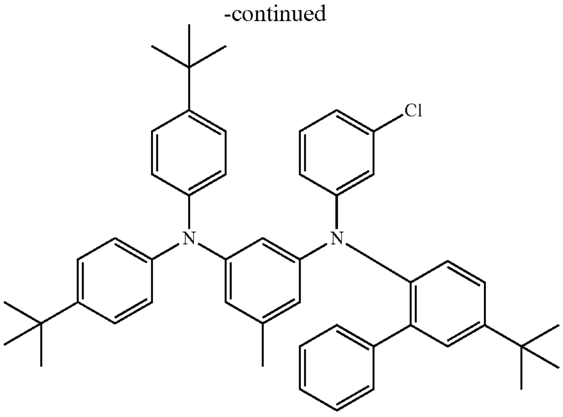

14

After 40 g of Intermediate 13, 35.3 g of 5-(tert-butyl)-[1, 1'-biphenyl]-2-amine, 20.6 g of sodium-tert-butoxide, and 0.5 g of bis(tri-tert-butylphosphine)palladium(0) were put into 600 ml of toluene under a nitrogen atmosphere, the resulting mixture was stirred under reflux for 1 hour. Thereafter, whether the reaction proceeded was confirmed, and then 18.8 g of 1-bromo-3-chlorobenzene was introduced thereinto during the stirring, and then the resulting mixture was stirred under reflux for 4 hours. After the completion of the reaction, the resulting product was extracted, and then recrystallized to obtain 53 g of Intermediate 14. (yield 76%). MS[M+H]+=706

3) Synthesis of Intermediate 15

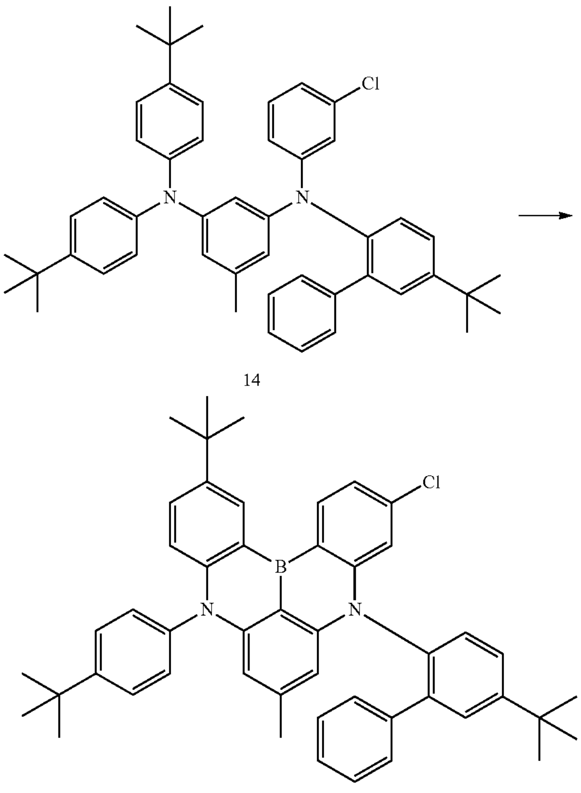

14

15

After 25 g of Intermediate 14 and 23.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 15 (yield 29%). MS[M+H]+=714

4) Synthesis of Compound 7

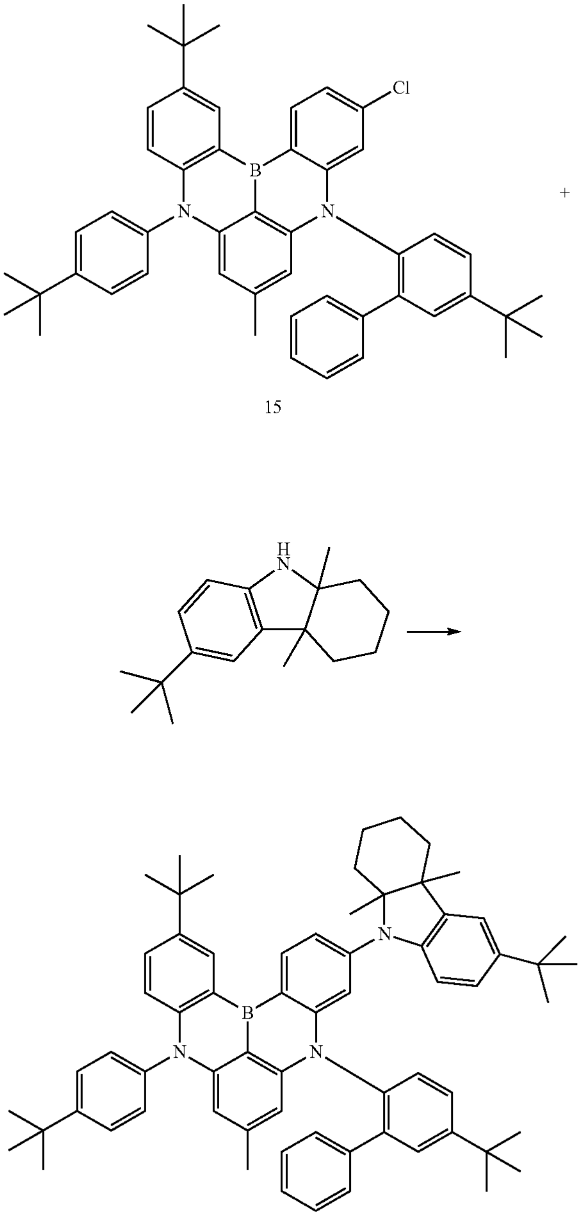

15

+

C-7

After 7 g of Intermediate 15, 2.6 g of 6-(tert-butyl)-4a, 9a-dimethyl-2,3,4,4a,9,9a-hexahydro-1H-carbazole, 1.9 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.2 g of Compound 7 (C-7). (yield 79%). MS[M+H]+=935

Synthesis Example 8. Synthesis of Compound 8

1) Synthesis of Intermediate 16

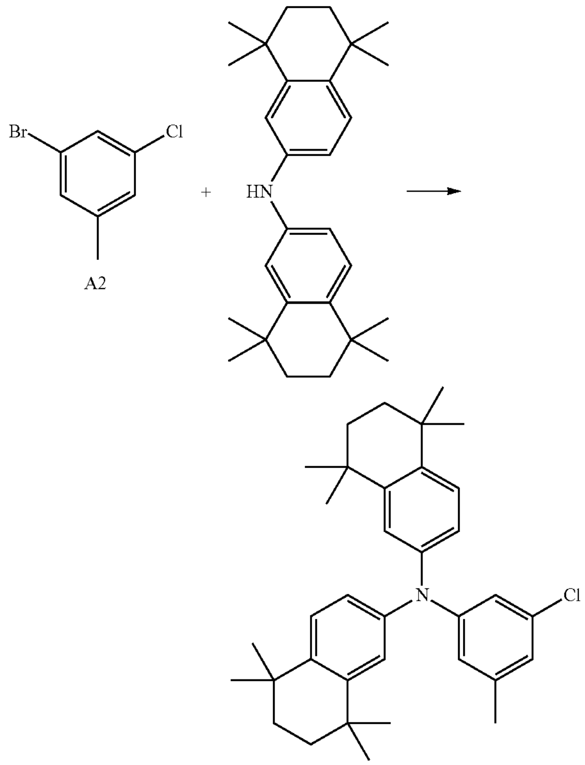

A2

16

After 40 g of A2, 75.8 g of bis(5,5,8,8-tetramethyl-5,6,7,8-tetrahydronaphthalen-2-yl)amine, 37.4 g of sodium-tert-butoxide, and 1.0 g of bis(tri-tert-butylphosphine)palladium (0) were put into 600 ml of toluene under a nitrogen atmosphere, the resulting mixture was stirred under reflux for 2 hours. After the completion of the reaction, the resulting product was extracted, and then recrystallized to obtain 72 g of Intermediate 16. (yield 72%). MS[M+H]+ =515

2) Synthesis of Intermediate 17

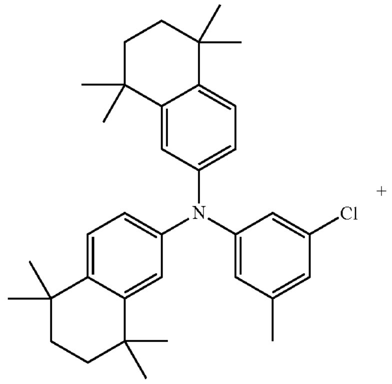

16

-continued

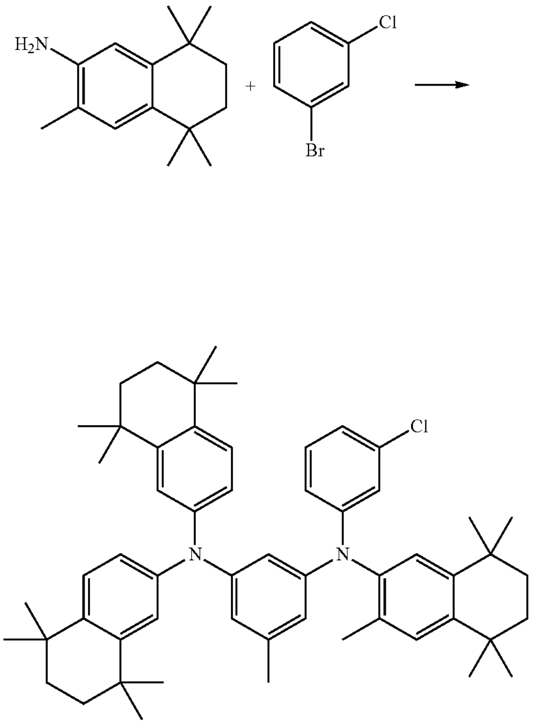

17

After 40 g of Intermediate 16, 16.9 g of 3,5,5,8,8-pentamethyl-5,6,7,8-tetrahydronaphthalen-2-amine, 18.7 g of sodium-tert-butoxide, and 0.4 g of bis(tri-tert-butylphosphine)palladium(0) were put into 600 ml of toluene under a nitrogen atmosphere, the resulting mixture was stirred under reflux for 1 hours. Thereafter, whether the reaction proceeded was confirmed, and then 14.9 g of 1-bromo-3-chlorobenzene was introduced thereinto during the stirring, and then the resulting mixture was stirred under reflux for 4 hours. After the completion of the reaction, the resulting product was extracted, and then recrystallized to obtain 45 g of Intermediate 17. (yield 72%). MS[M+H]+=806

3) Synthesis of Intermediate 18

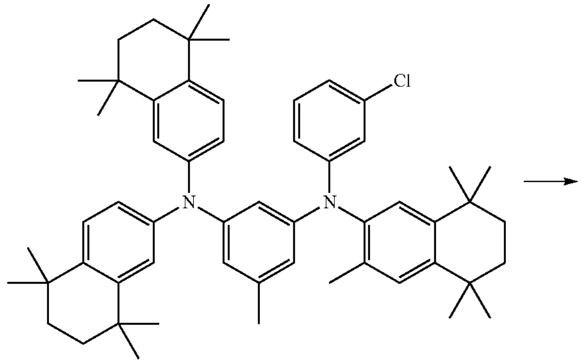

17

-continued

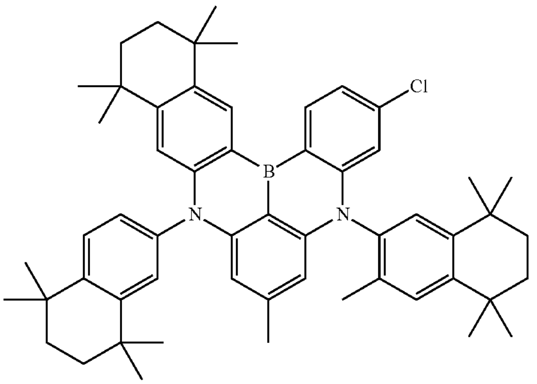

18

After 25 g of Intermediate 17 and 20.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 18 (yield 31%). MS[M+H]+ =814

4) Synthesis of Compound 8

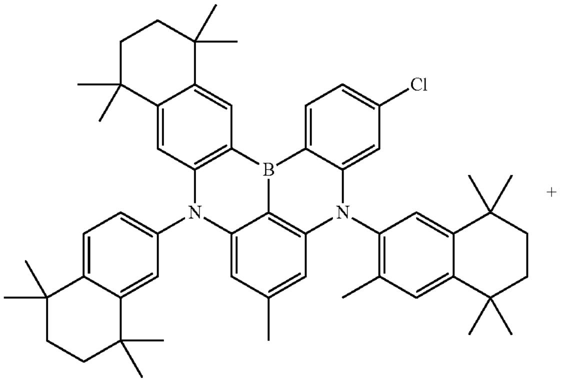

18

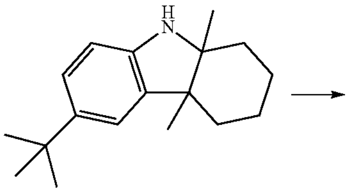

-continued

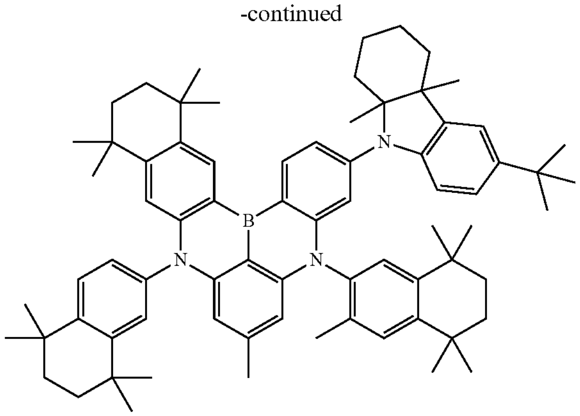

C-8

After 7 g of Intermediate 18, 2.2 g of 6-(tert-butyl)-4a,9a-dimethyl-2,3,4,4a,9,9a-hexahydro-1H-carbazole, 1.7 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.8 g of Compound 8 (C-8). (yield 76%). MS[M+H]+=1035

Synthesis Example 9. Synthesis of Compound 9

1) Synthesis of Intermediate 19

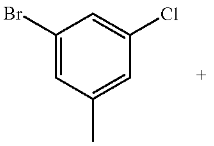

A2

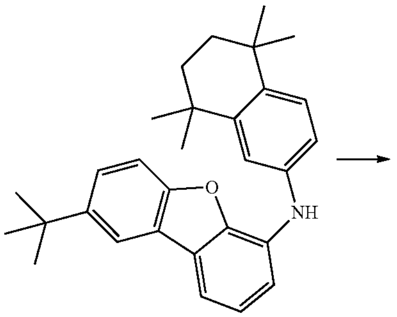

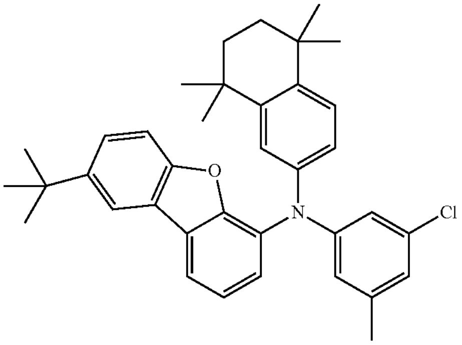

19

After 40 g of A2, 82.9 g of 8-(tert-butyl)-N-(5,5,8,8-tetramethyl-5,6,7,8-tetrahydronaphthalen-2-yl)dibenzo[b,d]furan-4-amine, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 77 g of Intermediate 19. (yield 72%). MS[M+H]+=551

2) Synthesis of Intermediate 20

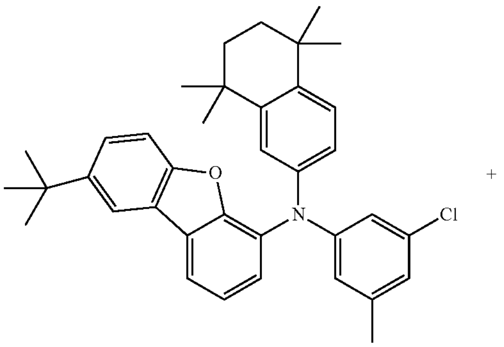

19

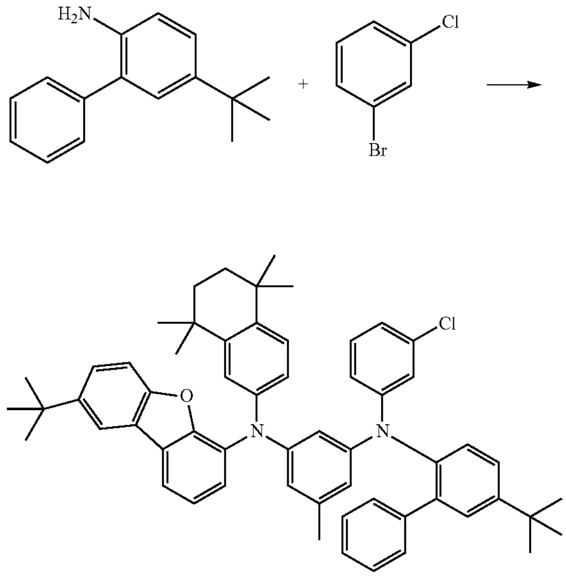

20

After 40 g of Intermediate 19, 16.4 g of 5-(tert-butyl)-[1, 1'-biphenyl]-2-amine, 0.4 g of bis(tri-tert-butylphosphine) palladium(0), and 19 g of sodium-tert-butoxide were put into 600 ml of toluene under a nitrogen atmosphere, the resulting mixture was stirred under reflux for 1 hours. Thereafter, whether the reaction proceeded was confirmed, and then 13.9 g of 1-bromo-3-chlorobenzene was introduced thereinto during the stirring, and then the resulting mixture was stirred under reflux for 4 hours. After the completion of the reaction, the resulting product was extracted, and then recrystallized to obtain 46 g of Intermediate 20. (yield 74%). MS[M+H]+=850

3) Synthesis of Intermediate 21

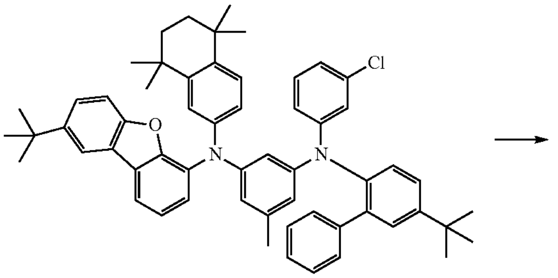

20

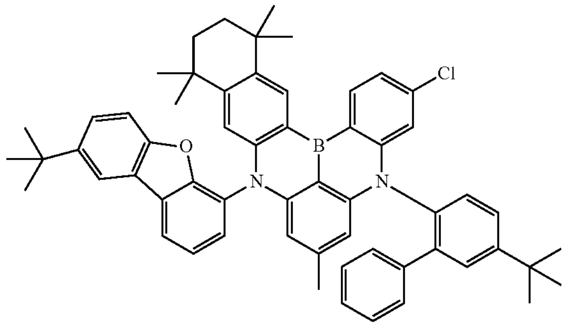

21

After 25 g of Intermediate 20 and 19.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 21 (yield 29%). MS[M+H]+=858

4) Synthesis of Compound 9

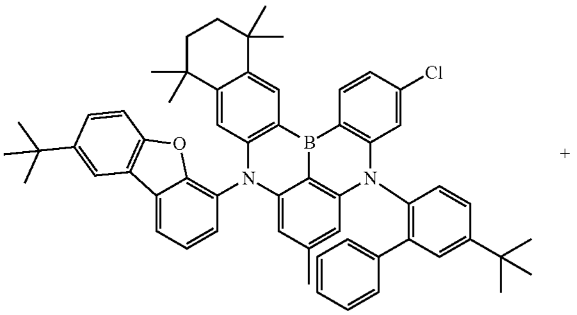

21

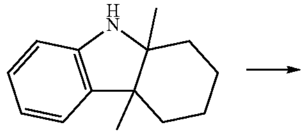

-continued

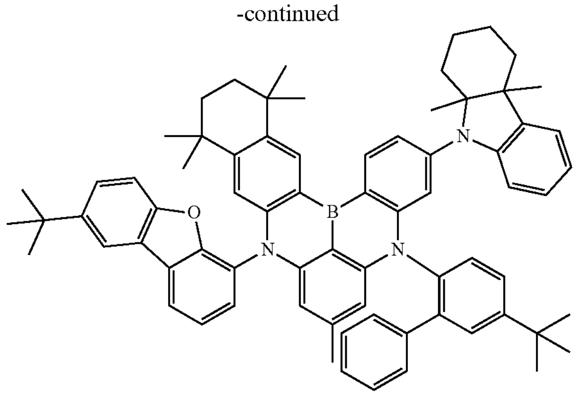

C-9

After 7 g of Intermediate 21, 1.6 g of 4a,9a-dimethyl-2,3,4,4a,9,9a-hexahydro-1H-carbazole, 1.6 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.4 g of Compound 9 (C-9). (yield 77%). MS[M+H]+=1023

Synthesis Example 10. Synthesis of Compound 10

1) Synthesis of Intermediate 22

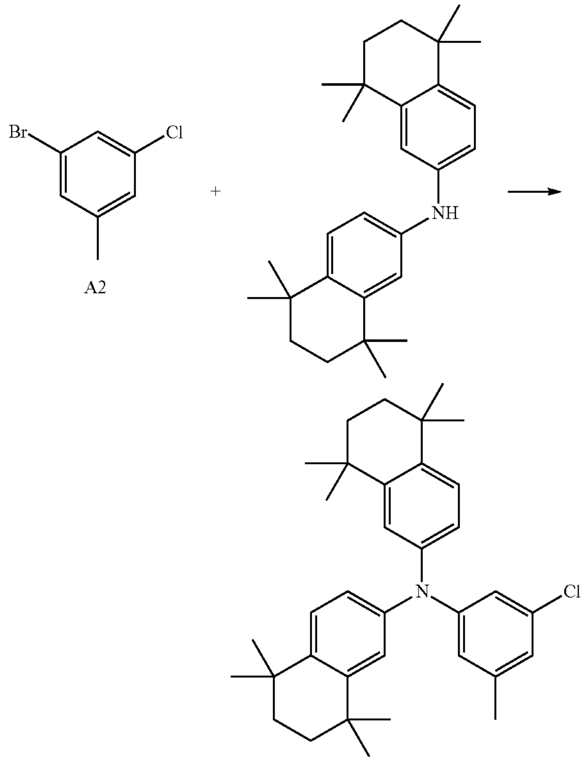

A2

22

After 40 g of A2, 75.8 g of bis(5,5,8,8-tetramethyl-5,6,7,8-tetrahydronaphthalen-2-yl)amine, 37.4 g of sodium-tert-butoxide, and 1.0 g of bis(tri-tert-butylphosphine)palladium (0) were put into 600 ml of toluene under a nitrogen atmosphere, the resulting mixture was stirred under reflux for 2 hours. After the completion of the reaction, the resulting product was extracted, and then recrystallized to obtain 75 g of Intermediate 22. (yield 75%). MS[M+H]+=515

2) Synthesis of Intermediate 23

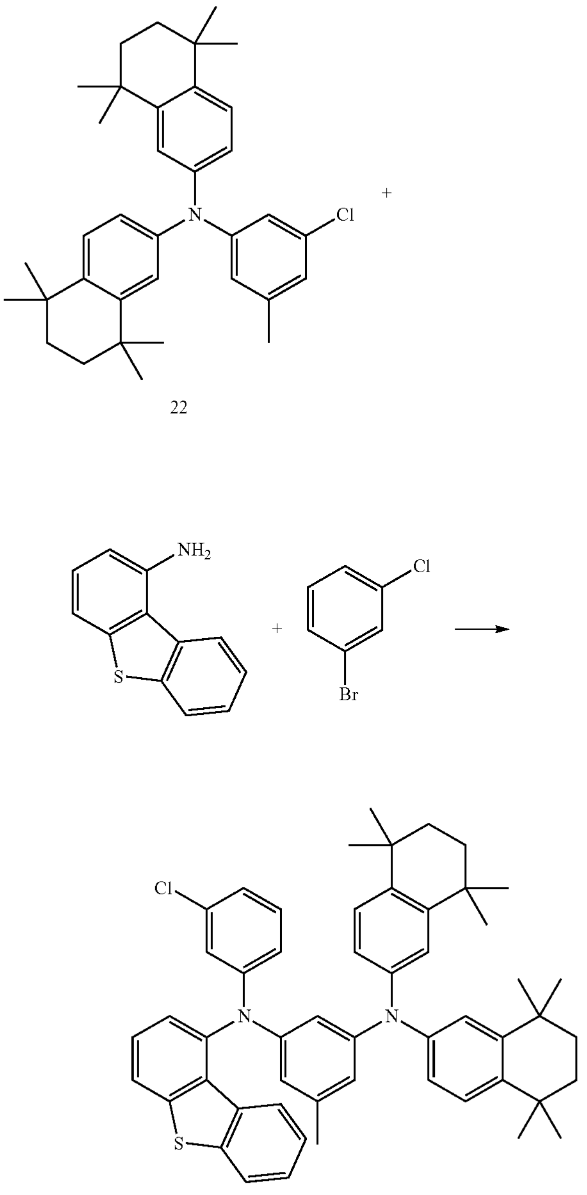

22

23

After 40 g of Intermediate 22, 15.5 g of dibenzo[b,d]thiophen-1-amine, and 0.4 g of bis(tri-tert-butylphosphine)palladium(0) were put into 600 ml of toluene under a nitrogen atmosphere, the resulting mixture was stirred under reflux for 1 hour. Thereafter, whether the reaction proceeded was confirmed, and then 14.9 g of 1-bromo-3-chlorobenzene was introduced thereinto during the stirring, and then the resulting mixture was stirred under reflux for 4 hours. After the completion of the reaction, the resulting product was extracted, and then recrystallized to obtain 43 g of Intermediate 23. (yield 70%). MS[M+H]+=788

3) Synthesis of Intermediate 24

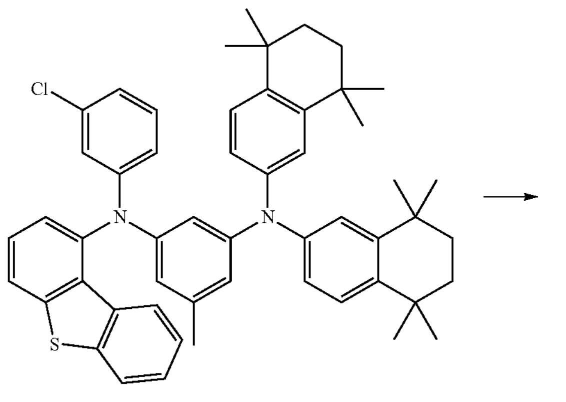

23

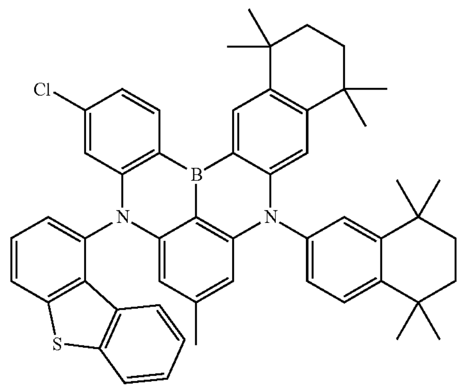

24

After 25 g of Intermediate 23 and 21.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Intermediate 24 (yield 30%). MS[M+H]+=796

4) Synthesis of Compound 10

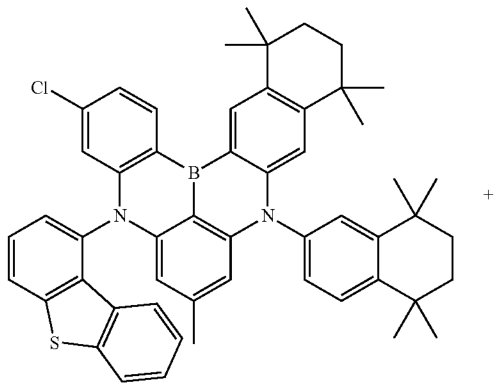

24

-continued

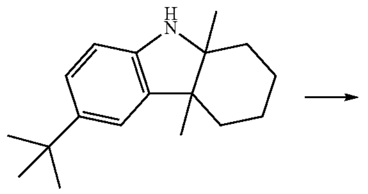

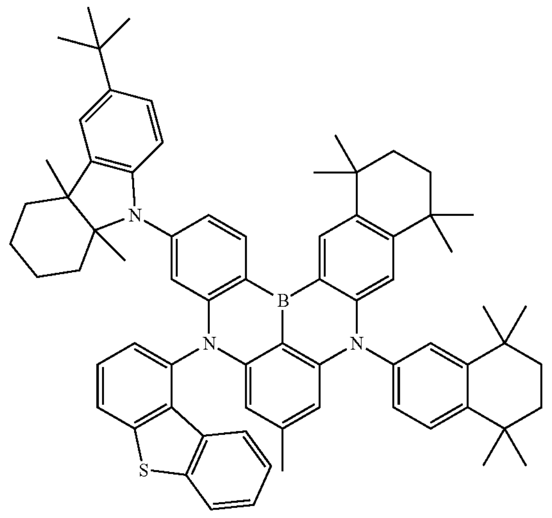

C-10

After 7 g of Intermediate 24, 2.3 g of 6-(tert-butyl)-4a, 9a-dimethyl-2,3,4,4a,9,9a-hexahydro-1H-carbazole, 1.7 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 10 (C-10). (yield 74%). MS[M+H]+=1017

Synthesis Example 11. Synthesis of Compound 11

1) Synthesis of Intermediate 25

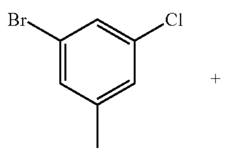

A2

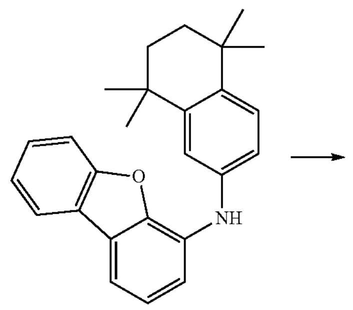

-continued

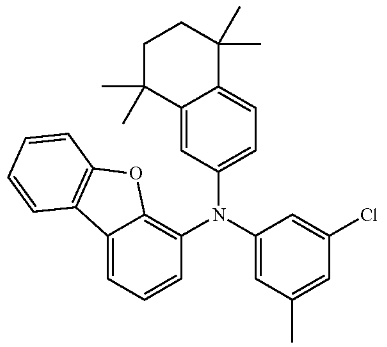

25

After 40 g of A2, 71.9 g of N-(5,5,8,8-tetramethyl-5,6,7,8-tetrahydronaphthalen-2-yl)dibenzo[b,d]furan-4-amine, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 72 g of Intermediate 25. (yield 75%). MS[M+H]+=495

2) Synthesis of Intermediate 26

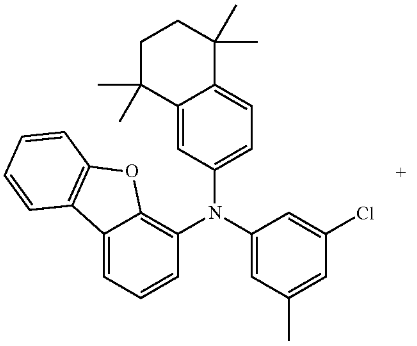

25

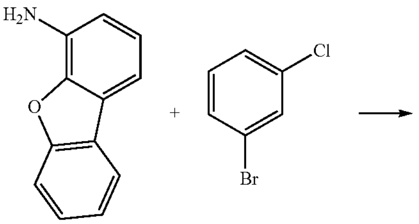

-continued

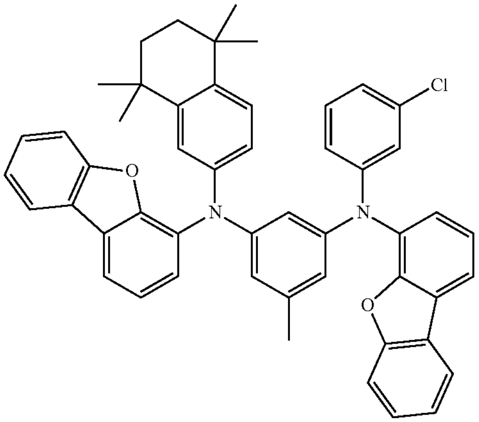

26

After 40 g of Intermediate 25, 14.8 g of dibenzo[b,d]furan-4-amine, 0.4 g of bis(tri-tert-butylphosphine)palladium(0), and 19 g of sodium-tert-butoxide were put into 600 ml of toluene under a nitrogen atmosphere, the resulting mixture was stirred under reflux for 1 hour. Thereafter, whether the reaction proceeded was confirmed, and then 15.5 g of 1-bromo-3-chlorobenzene was introduced thereinto during the stirring, and then the resulting mixture was stirred under reflux for 4 hours.

After the completion of the reaction, the resulting product was extracted, and then recrystallized to obtain 45 g of Intermediate 26. (yield 74%). MS[M+H]+=752

3) Synthesis of Intermediate 27

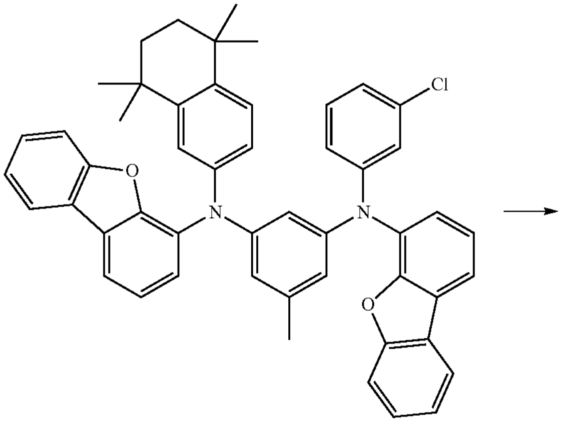

26

-continued

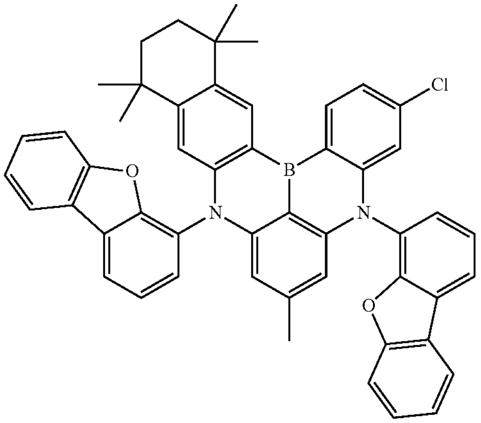

27

After 25 g of Intermediate 26 and 22.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 27 (yield 30%). MS[M+H]+=760

4) Synthesis of Compound 11

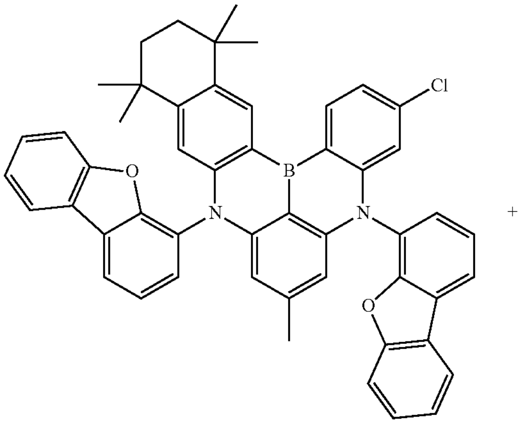

27

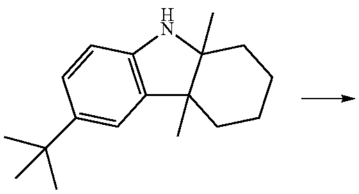

-continued

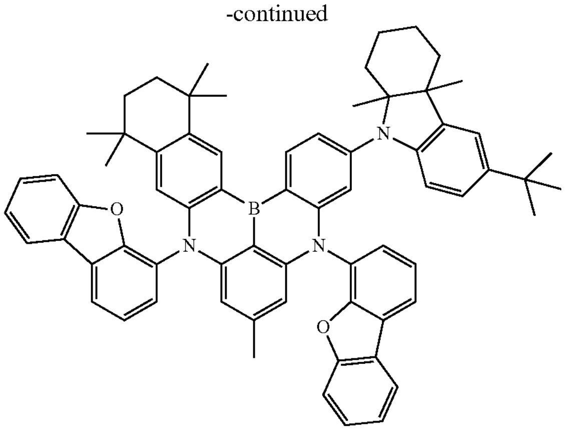

C-11

After 7 g of Intermediate 27, 2.4 g of 6-(tert-butyl)-4a,9a-dimethyl-2,3,4,4a,9,9a-hexahydro-1H-carbazole, 1.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.7 g of Compound 11 (C-11). (yield 74%). MS[M+H]+=981

Synthesis Example 12. Synthesis of Compound 12

1) Synthesis of Intermediate 28

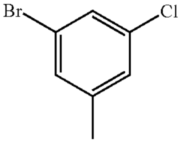

A2

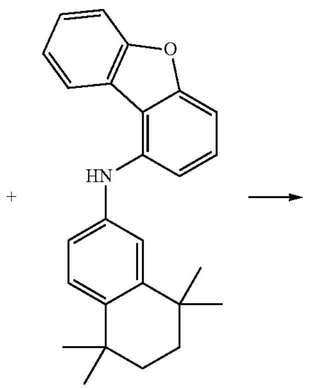

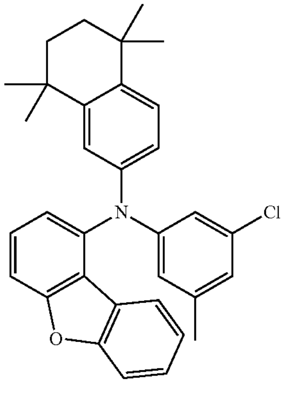

28

After 40 g of A2, 71.9 g of N-(5,5,8,8-tetramethyl-5,6,7,8-tetrahydronaphthalen-2-yl)dibenzo[b,d]furan-1-amine, 37.4 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 73 g of Intermediate 28. (yield 76%). MS[M+H]+=495

2) Synthesis of Intermediate 29

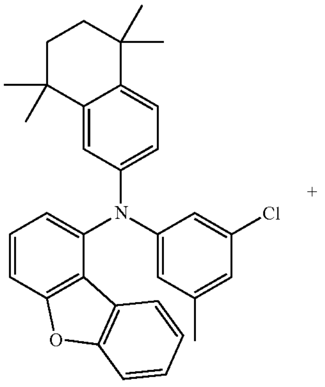

28

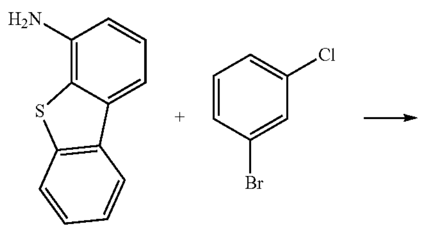

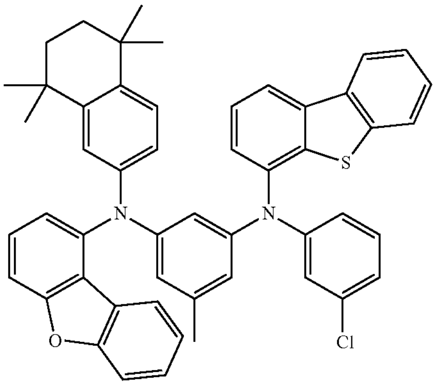

29

After 40 g of Intermediate 28, 16.1 g of dibenzo[b,d]thiophen-4-amine, and 0.4 g of bis(tri-tert-butylphosphine)palladium(0) were put into 600 ml of toluene under a nitrogen atmosphere, the resulting mixture was stirred under reflux for 1 hour. Thereafter, whether the reaction proceeded was confirmed, and then 15.5 g of 1-bromo-3-chlorobenzene was introduced thereinto during the stirring, and then the resulting mixture was stirred under reflux for 4 hours. After the completion of the reaction, the resulting product was extracted, and then recrystallized to obtain 44 g of Intermediate 29. (yield 71%). MS[M+H]+=768

3) Synthesis of Intermediate 30

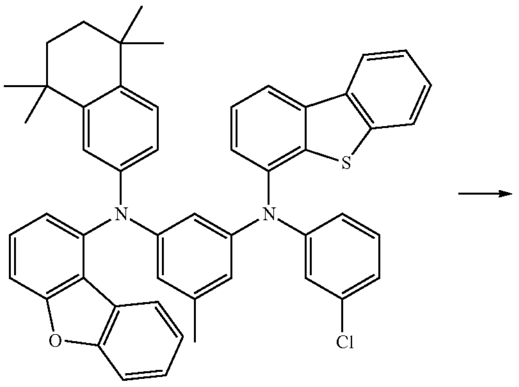

29

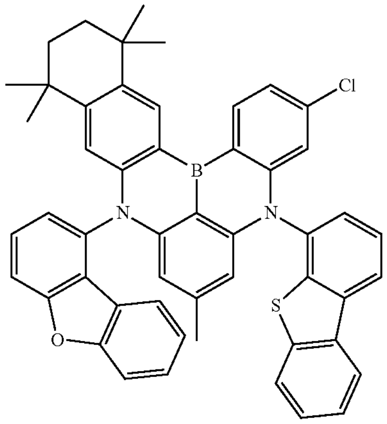

30

After 25 g of Intermediate 29 and 21.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 30 (yield 29%). MS[M+H]+=776

4) Synthesis of Compound 12

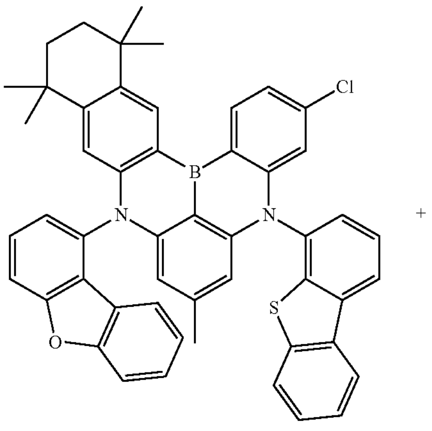

30

-continued

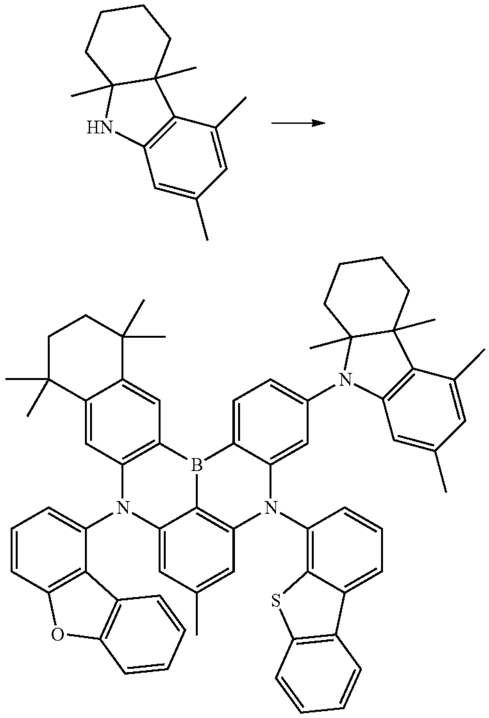

C-12

After 7 g of Intermediate 30, 2.1 g of 4a,5,7,9a-tetramethyl-2,3,4,4a,9,9a-hexahydro-1H-carbazole, 1.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.8 g of Compound 12 (C-12). (yield 78%). MS[M+H]+=969

Synthesis Example 13. Synthesis of Compound 13

1) Synthesis of Intermediate 31

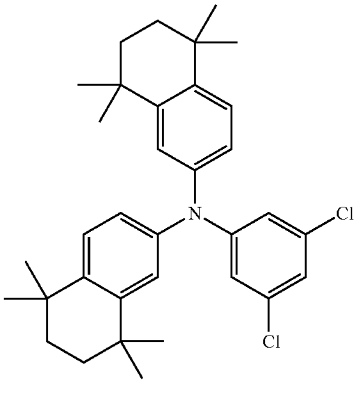

7

+

-continued

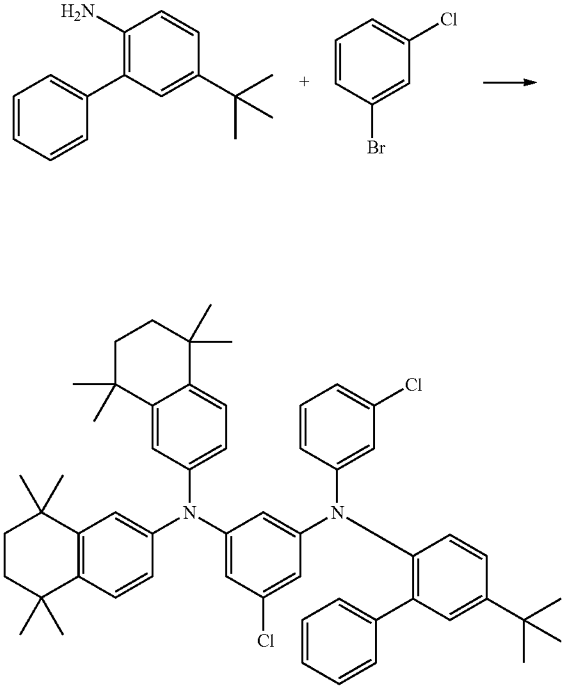

31

After 40 g of Intermediate 7, 16.9 g of 5-(tert-butyl)-[1,1'-biphenyl]-2-amine, 0.4 g of bis(tri-tert-butylphosphine)palladium(0), and 18 g of sodium-tert-butoxide were put into 600 ml of toluene under a nitrogen atmosphere, the resulting mixture was stirred under reflux for 1 hour. Thereafter, whether the reaction proceeded was confirmed, and then 14.3 g of 1-bromo-3-chlorobenzene was introduced thereinto during the stirring, and then the resulting mixture was stirred under reflux for 4 hours. After the completion of the reaction, the resulting product was extracted, and then recrystallized to obtain 45 g of Intermediate 31. (yield 72%). MS[M+H]+=835

2) Synthesis of Intermediate 32

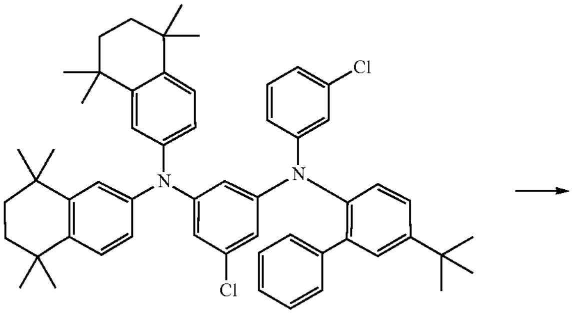

31

-continued

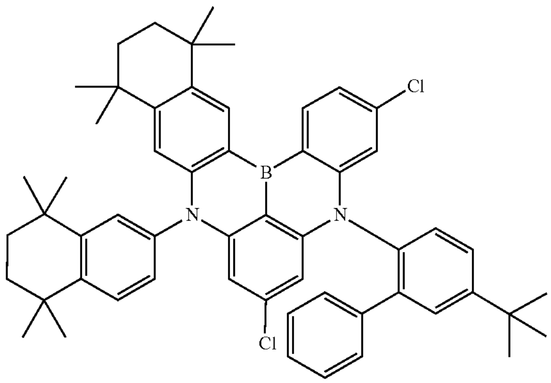

32

-continued

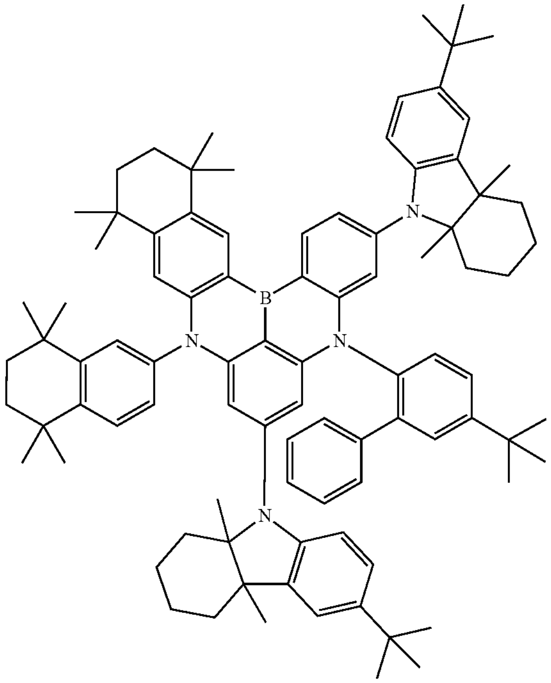

C-13

After 25 g of Intermediate 31 and 20.0 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 32 (yield 29%). MS[M+H]+=843

3) Synthesis of Compound 13

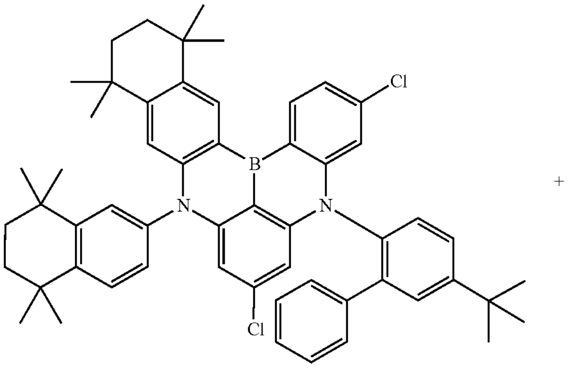

32

After 7 g of Intermediate 32, 4.3 g of 6-(tert-butyl)-4a, 9a-dimethyl-2,3,4,4a,9,9a-hexahydro-1H-carbazole, 1.6 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.7 g of Compound 13 (C-13). (yield 72%). MS[M+H]+=1284

Synthesis Example A-1. Synthesis of Intermediates 35, 38, 41, 46, 49, 52, and 55

1) Synthesis of Intermediate 35

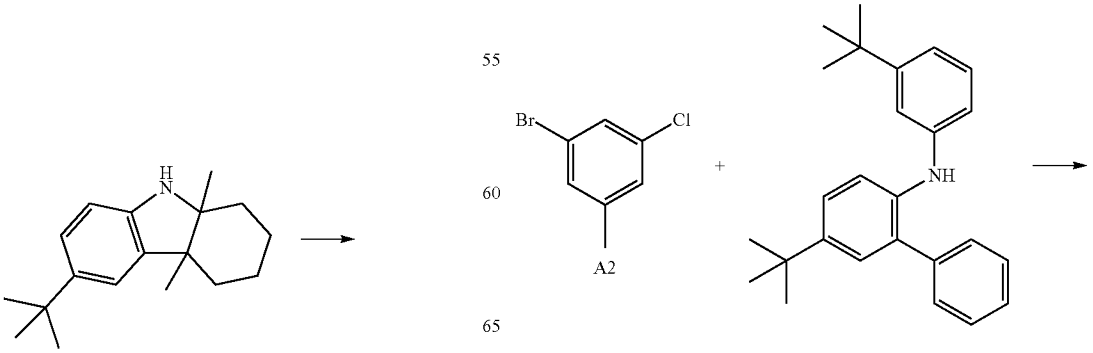

A2

-continued
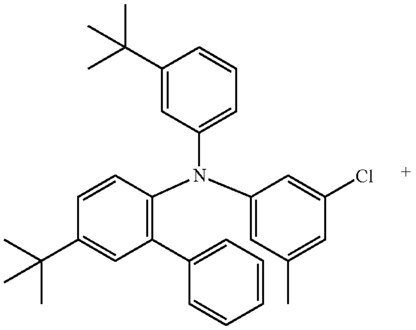
33
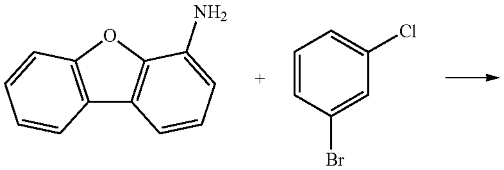
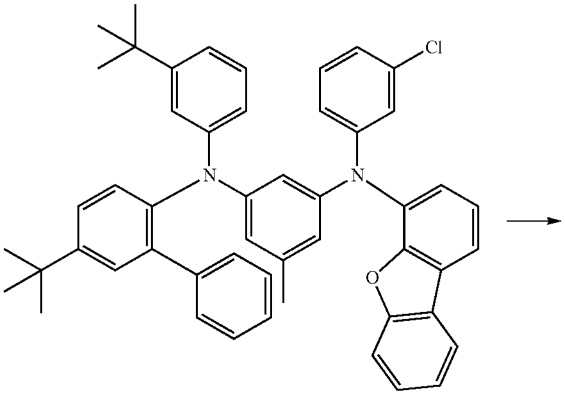
34
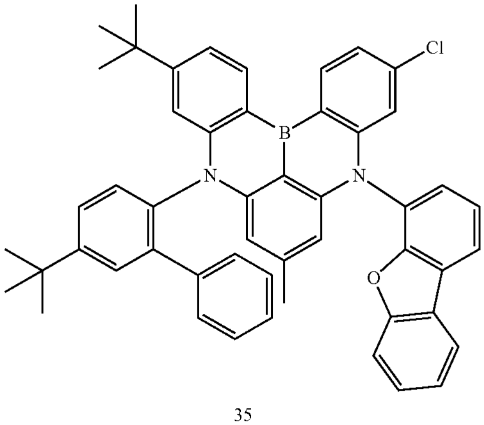
35
1) Synthesis of Intermediate 38
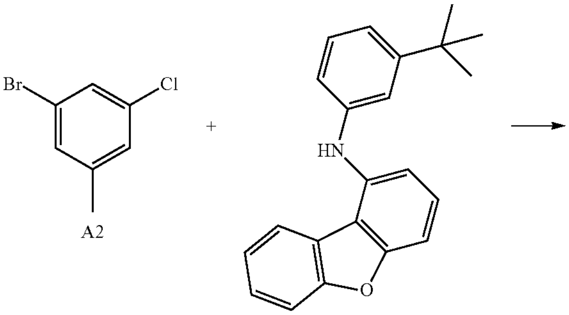
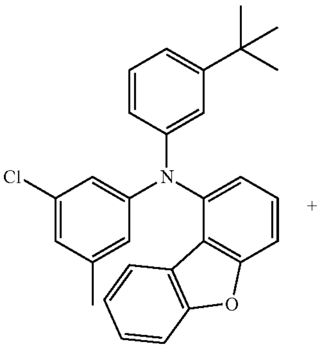
36
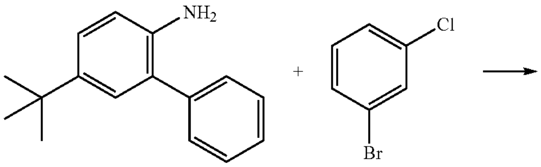
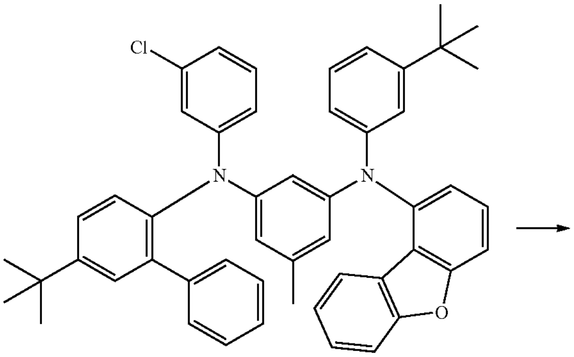
37
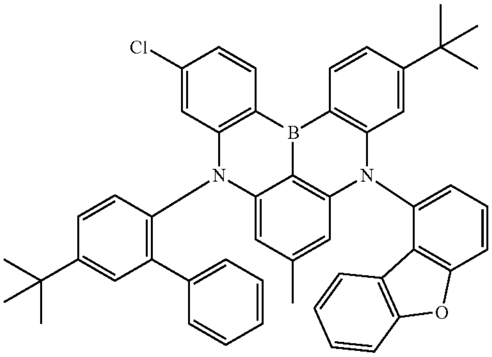
38

1) Synthesis of Intermediate 41
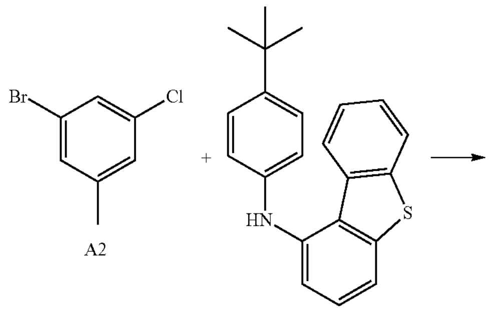
A2
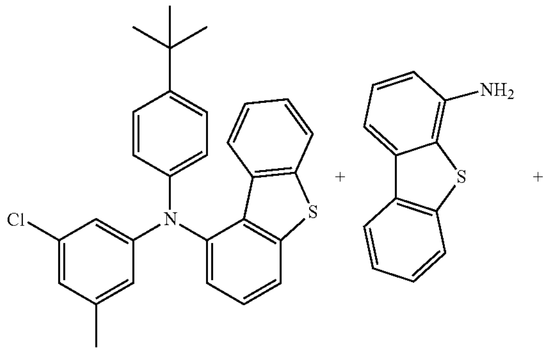
39
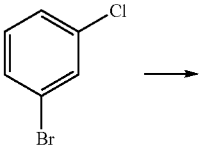
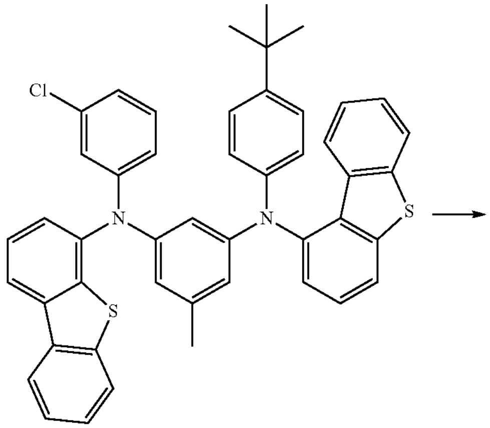
40
-continued
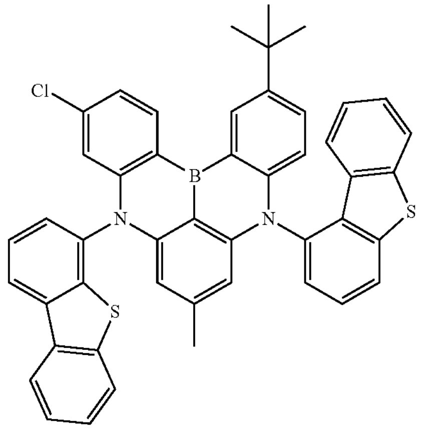
41
1) Synthesis of Intermediate 46
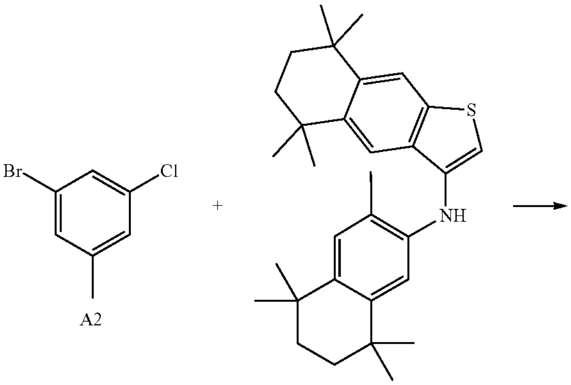
A2
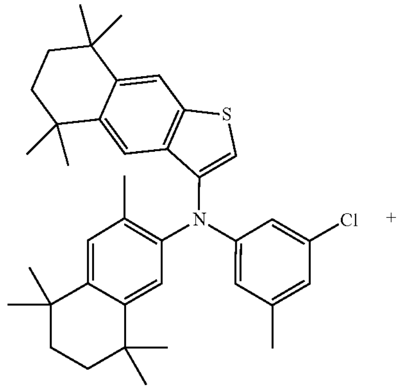
44
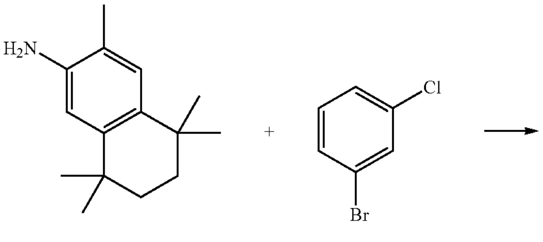

-continued
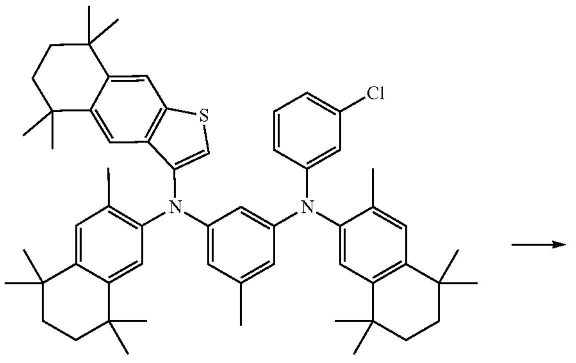
45
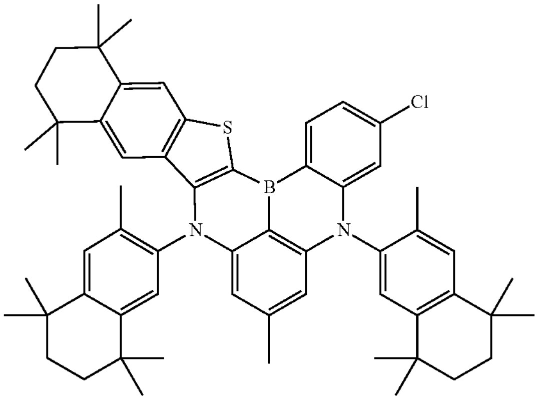
46
1) Synthesis of Intermediate 49
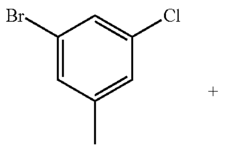
A2
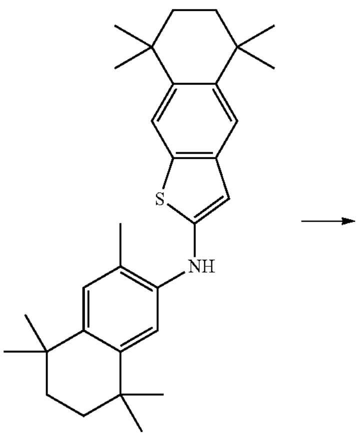
-continued
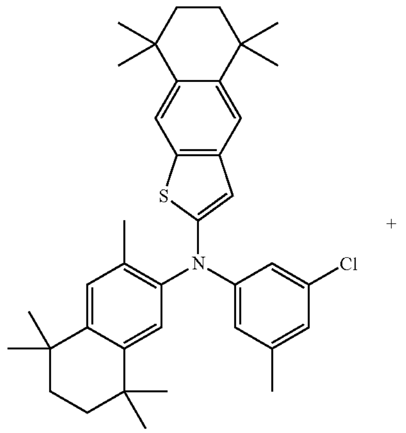
47
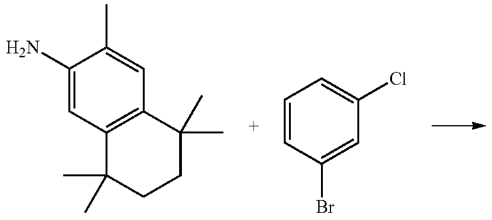
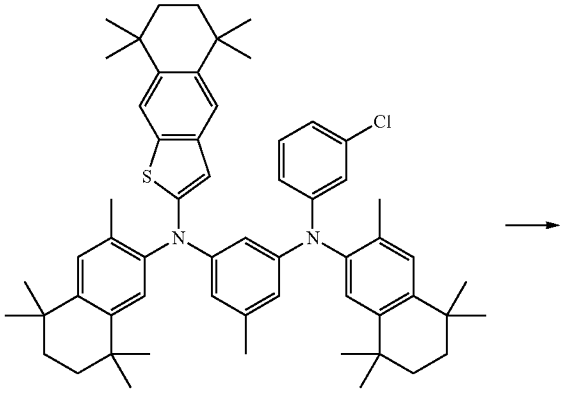
48
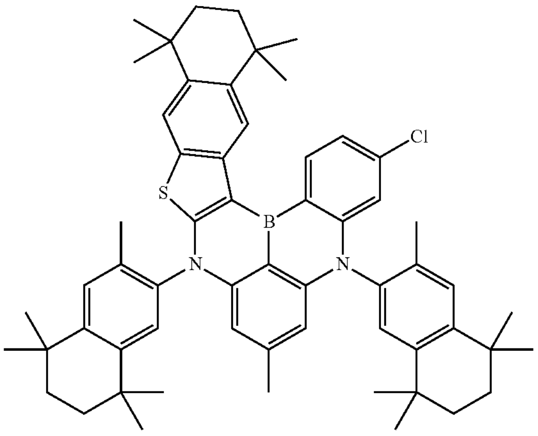
49

1) Synthesis of Intermediate 52
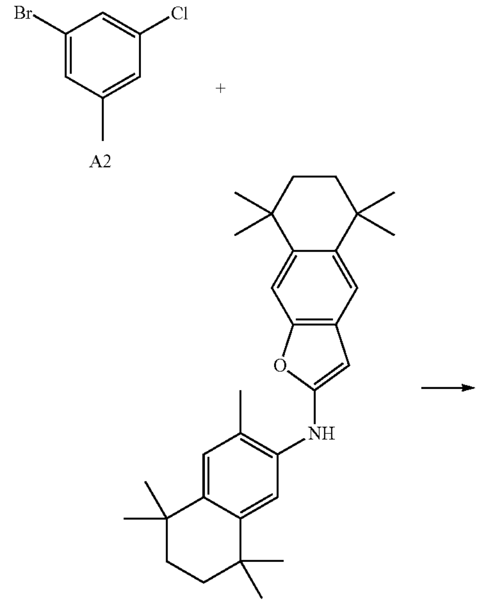
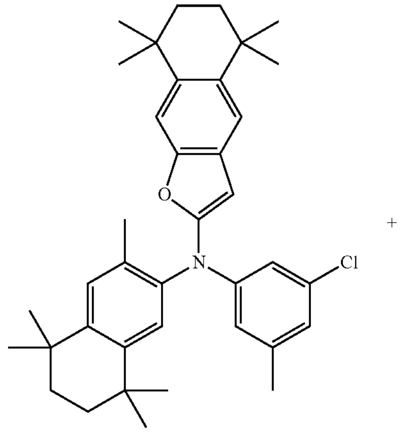
50
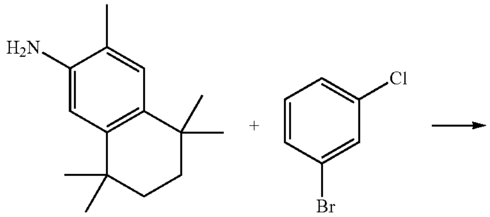
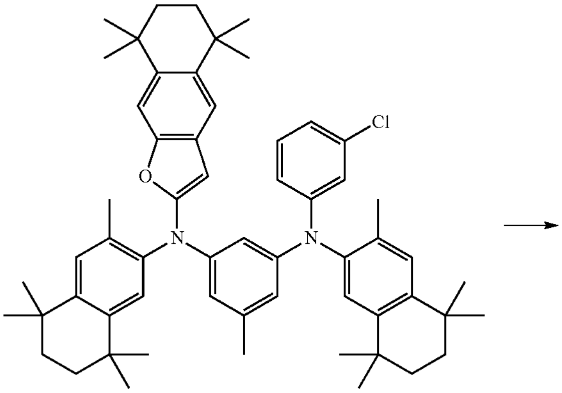
51
-continued
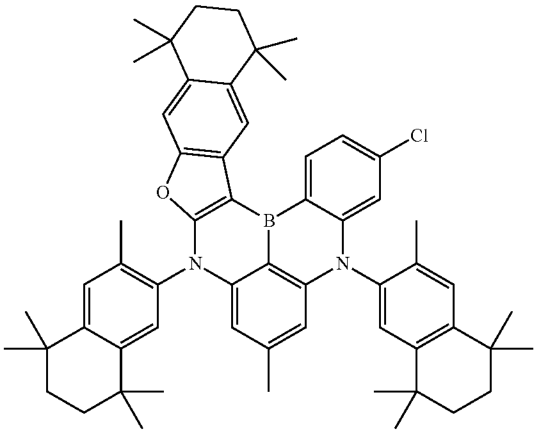
52
1) Synthesis of Intermediate 55
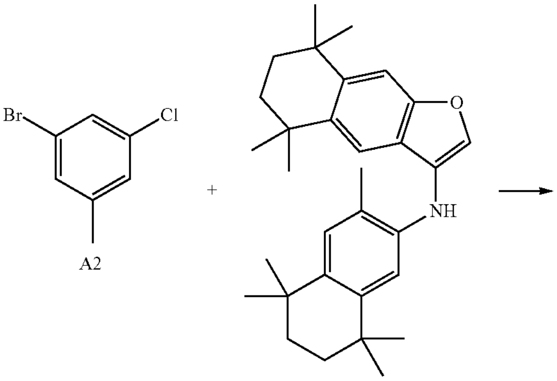
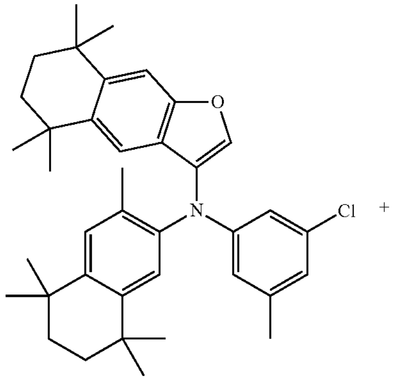
53
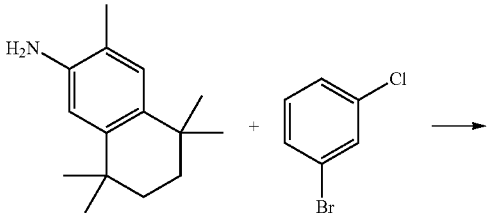

-continued

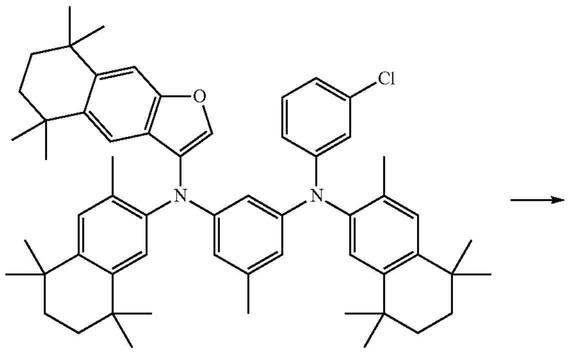

54

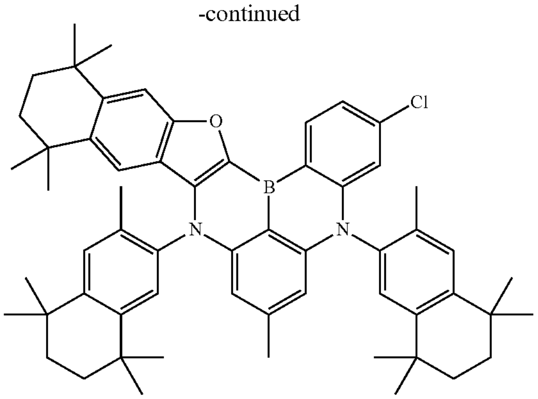

55

The above intermediates 35, 38, 41, 46, 49, 52 and 55 were synthesized using the same method as the synthetic process of Intermediates 13 to 15 of Synthesis Example 7. The materials used in each step, the yields and the mass values are shown in the following Table 10.

TABLE 10

| | Used material | | | Obtained | |
|---|---|---|---|---|---|
| Intermediate 35 | Used material 1 | Used material 2 | Used material 3 | amount/ Yield | MS [M+H]+ |
| 1STEP | A2 | 5-(tert-butyl)-N-(3-(tert-butyl)phenyl)-[1,1'-biphenyl]-2-amine | | 69 g/ 74% | 483 |
| 2STEP | Intermediate 33 | Dibenzo[b,d] furan-4-amine | 1-bromo-3-chlorobenzene | 44 g/ 72% | 740 |
| 3STEP | Intermediate 44 | | | 7.4g/ 29% | 748 |
| Intermediate 36 | Used material 1 | Used material 2 | Used material 3 | | |
| 1STEP | A2 | N-(3-(tert-butylI)phenyl) dibenzo[b,d,] furan-1-amine | | 64 g/ 75% | 441 |
| 2STEP | Intermediate 36 | 5-(tert-butylI)-[1,1'-biphenyl]-2-amine | 1-bromo-3-chlorobenzene | 42 g/ 52% | 740 |
| 3STEP | Intermediate 37 | | | 7.5g/ 35% | 748 |
| Intermediate 41 | Used material 1 | Used material 2 | Used material 3 | | |
| 1STEP | A2 | N-(3-(tert-butyl) phenyl)dibenzo[b,d] thiophen-1-amine | | 66 g/ 74% | 457 |
| 2STEP | Intermediate 39 | Dibenzo[b,d] thiophen-4-amine | 1-bromo-3-chlorobenzene | 46 g/ 71% | 730 |
| 3STEP | Intermediate 40 | | | 7.3g/ 29% | 738 |
| Intermediate 46 | Used material 1 | Used material 2 | Used material 3 | | |
| 1STEP | A2 | 5,5,8,8-tetramethyl-N-(3,5,5,8,8-pentamethyl-5,6,7,8-tetrahydronaphthalen-2-yl)-5,6,7,8-tetrahydronaphtho [2,3-b]thiophen-3-amine | | 77 g/ 68% | 585 |
| 2STEP | Intermediate 44 | 3,5,5,8,8-pentamethyl-5,6,7,8- | 1-bromo-3-chlorobenzene | 43 g/ 72% | 876 |

TABLE 10-continued

| | Used material | | | Obtained | |
|---|---|---|---|---|---|
| Intermediate 35 | Used material 1 | Used material 2 | Used material 3 | amount/ Yield | MS [M+H]+ |
| | | tetrahydronaphthalen-2-amine | | | |
| 3STEP | Intermediate 45 | | | 7.5g/ 30% | 884 |
| Intermediate 49 | Used material 1 | Used material 2 | Used material 3 | | |
| 1STEP | A2 | 5,5,8,8-tetramethyl-N-(3,5,5,8,8-pentamethyl-5,6,7,8-tetrahydronaphthalen-2-yl)-5,6,7,8-tetrahydronaphtho[2,3-b]thiophen-2-amine | | 81 g/ 71% | 585 |
| 2STEP | Intermediate 47 | 3,5,5,8,8-pentamethyl-5,6,7,8-tetrahydronaphthalen-2-amine | 1-bromo-3-chlorobenzene | 42 g/ 70% | 876 |
| 3STEP | Intermediate 48 | | | 7.6g/ 30% | 884 |
| Intermediate 52 | Used material 1 | Used material 2 | Used material 3 | | |
| 1STEP | A2 | 5,5,8,8-tetramethyl-N-(3,5,5,8,8-pentamethyl-5,6,7,8-tetrahydronaphthalen-2-yl)-5,6,7,8-tetrahydronaphtho[2,3-b]furan-2-amine | | 80 g/ 72% | 569 |
| 2STEP | Intermediate 50 | 3,5,5,8,8-pentamethyl-5,6,7,8-tetrahydronaphthalen-2-amine | 1-bromo-3-chlorobenzene | 47 g/ 78% | 860 |
| 3STEP | Intermediate 51 | | | 7.4g/ 29% | 868 |
| Intermediate 55 | Used material 1 | Used material 2 | Used material 3 | | |
| 1STEP | A2 | 5,5,8,8-tetramethyl-N-(3,5,5,8,8-pentamethyl-5,6,7,8-tetrahydronaphthalen-2-yl)-5,6,7,8-tetrahydronaphtho[2,3-b]furan-3-amine | | 81 g/ 73% | 569 |
| 2STEP | Intermediate 53 | 3,5,5,8,8-pentamethyl-5,6,7,8-tetrahydronaphthalen-2-amine | 1-bromo-3-chlorobenzene | 43 g/ 71% | 860 |
| 3STEP | Intermediate 54 | | | 7.5g/ 30% | 868 |

Synthesis Example 14. Synthesis of Compound 14

1) Synthesis of Compound 14

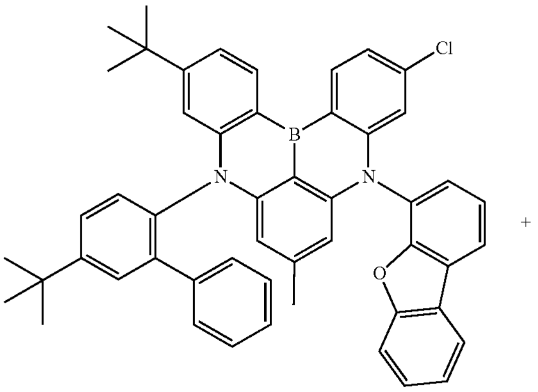

35

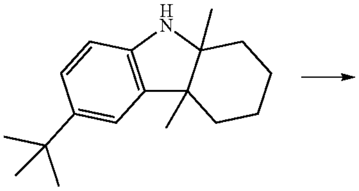

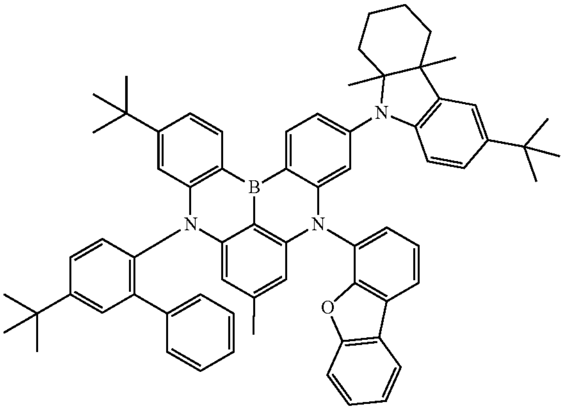

C-14

After 7 g of Intermediate 35, 2.4 g of 6-(tert-butyl)-2,3,4,4a,9,9a-hexahydro-1H-carbazole, 1.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.4 g of Compound 14 (C-14). (yield 82%). MS[M+H]+=969

Synthesis Example 15. Synthesis of Compound 15

1) Synthesis of Compound 15

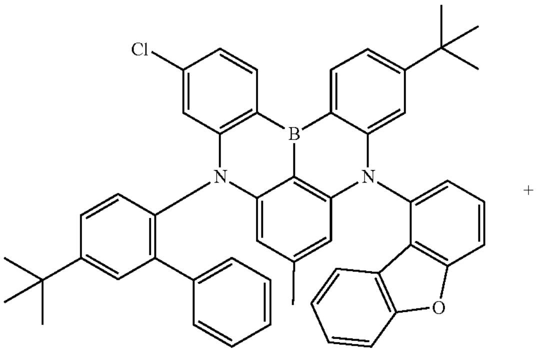

38

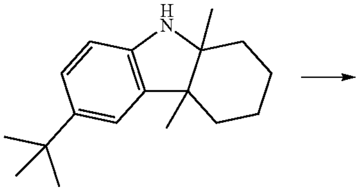

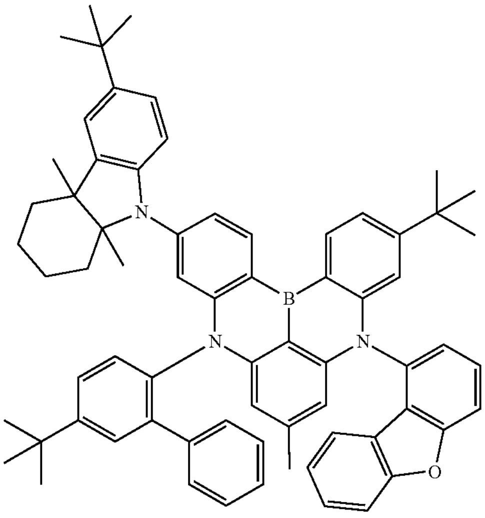

C-15

After 7 g of Intermediate 38, 2.4 g of 6-(tert-butyl)-2,3,4,4a,9,9a-hexahydro-1H-carbazole, 1.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.3 g of Compound 15 (C-15). (yield 81%). MS[M+H]+=969

Synthesis Example 16. Synthesis of Compound 16

1) Synthesis of Compound 16

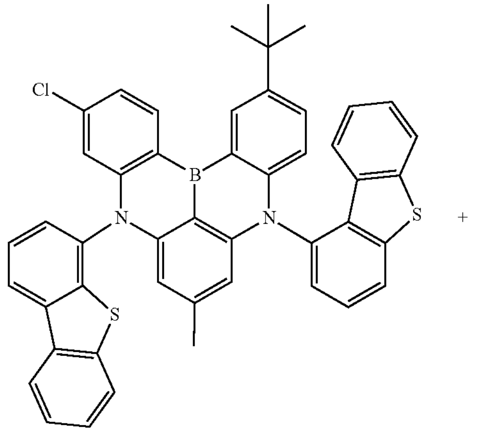

41

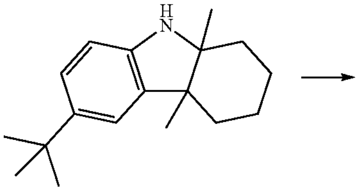

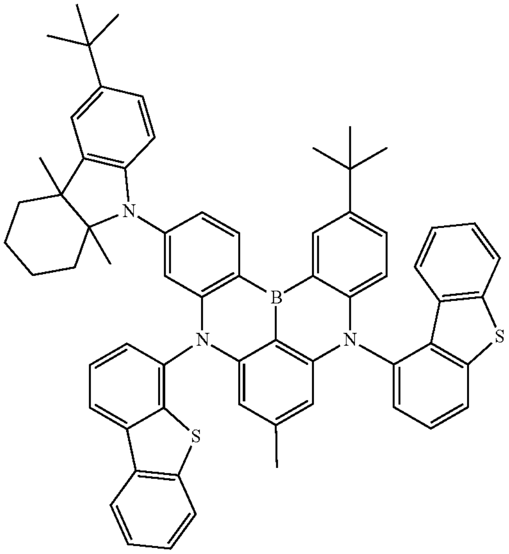

C-16

After 7 g of Intermediate 41, 2.5 g of 6-(tert-butyl)-2,3,4,4a,9,9a-hexahydro-1H-carbazole, 1.8 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 7.2 g of Compound 16 (C-16). (yield 79%). MS[M+H]+=959

Synthesis Example 17. Synthesis of Compound 17

1) Synthesis of Intermediate 42

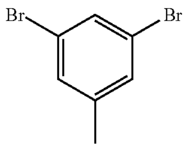

A3

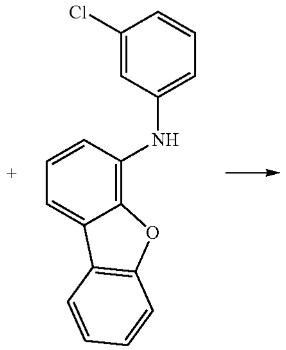

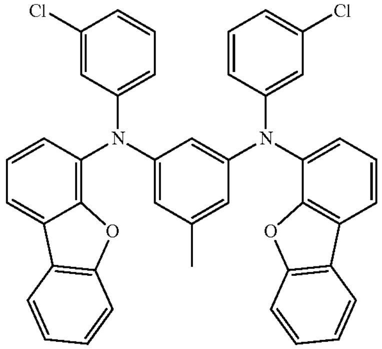

42

After 30 g of A3, 70.5 g of N-(3-chlorophenyl)dibenzo[b,d]furan-4-amine, 57.7 g of sodium-tert-butoxide, and 0.6 g of bis(tri-tert-butylphosphine)palladium(0) were put into 600 ml of toluene under a nitrogen atmosphere, the resulting mixture was stirred under reflux for 5 hours. After the completion of the reaction, the resulting product was extracted, and then recrystallized to obtain 58 g of Intermediate 42. (yield 72%). MS[M+H]+=676

2) Synthesis of Intermediate 43

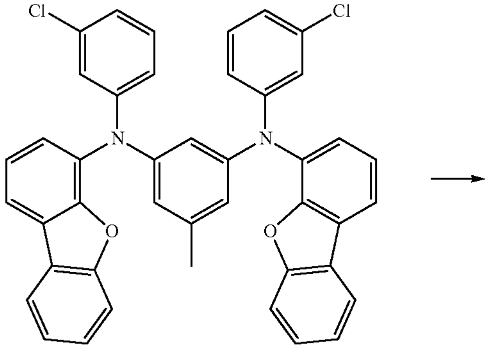

42

-continued

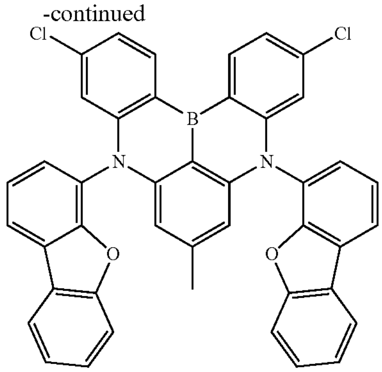

43

After 25 g of Intermediate 42 and 24.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Intermediate 43 (yield 30%). MS[M+H]+=684

3) Synthesis of Compound 17

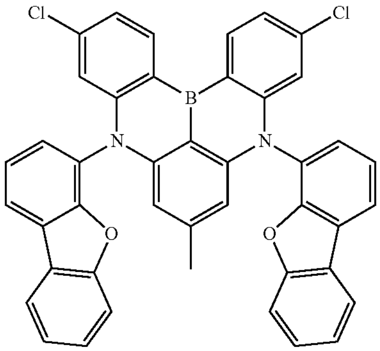

43

+

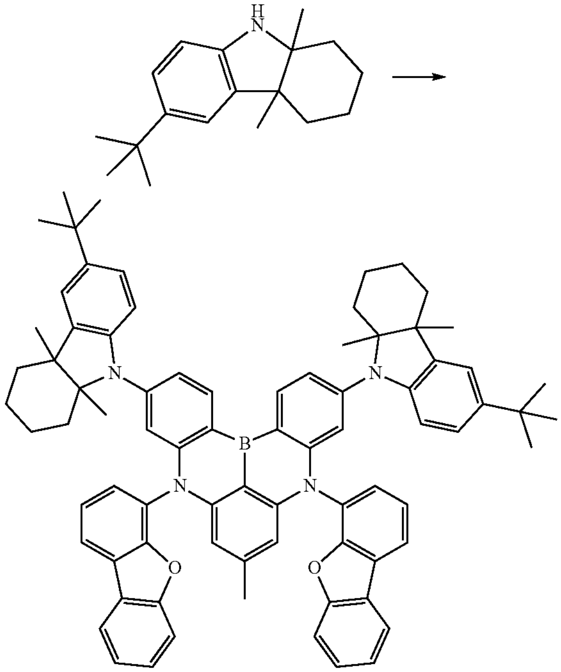

C-17

After 7 g of Intermediate 43, 5.3 g of 4a,5,7,9a-tetramethyl-2,3,4,4a,9,9a-hexahydro-1H-carbazole, 3.9 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 8.1 g of Compound 17 (C-17). (yield 70%). MS[M+H]+=1126

Synthesis Example 18. Synthesis of Compound 22

1) Synthesis of Intermediate 56

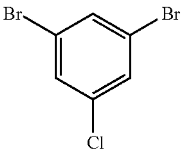

A1

+

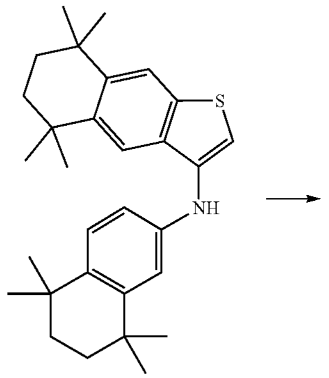

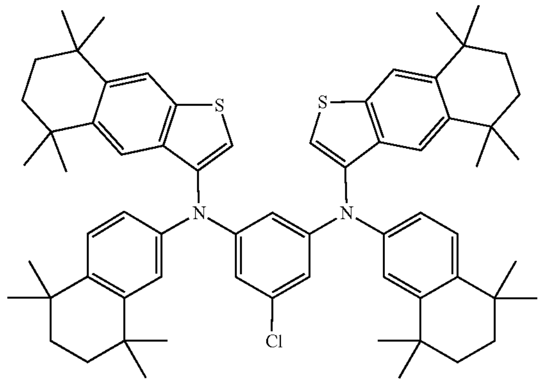

56

After 20 g of Al, 66 g of 5,5,8,8-tetramethyl-N-(5,6,7,8-tetramethyl-5,6,7,8-tetrahydronaphthalen-2-yl)-5,6,7,8-tetrahydronaphtho[2,3-b]thiophen-3-amine, 35.6 g of sodium-tert-butoxide, and 0.4 g of bis(tri-tert-butylphosphine) palladium(0) were put into 500 ml of toluene under a nitrogen atmosphere, the resulting mixture was stirred under reflux for 5 hours. After the completion of the reaction, the resulting product was extracted, and then recrystallized to obtain 58 g of Intermediate 56. (yield 78%). MS[M+H]+=1000

2) Synthesis of Intermediate 57

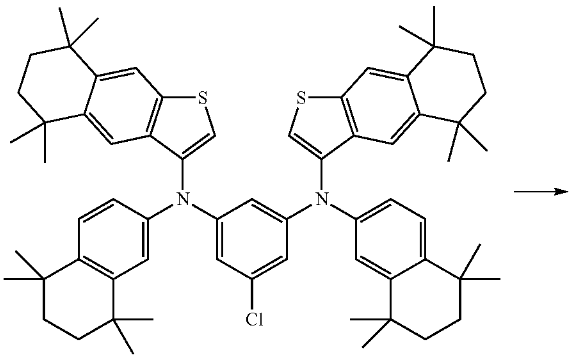

56

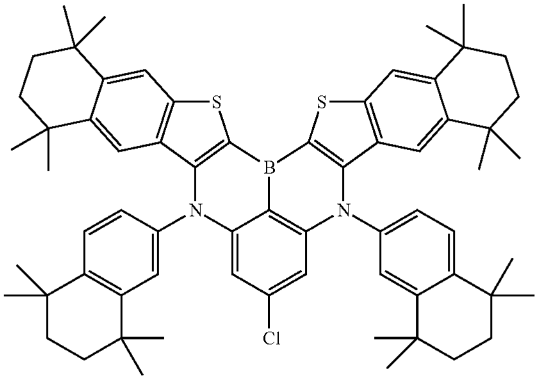

57

After 25 g of Intermediate 56 and 16.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.0 g of Intermediate 57 (yield 28%). MS[M+H]+=1008

3) Synthesis of Compound 22

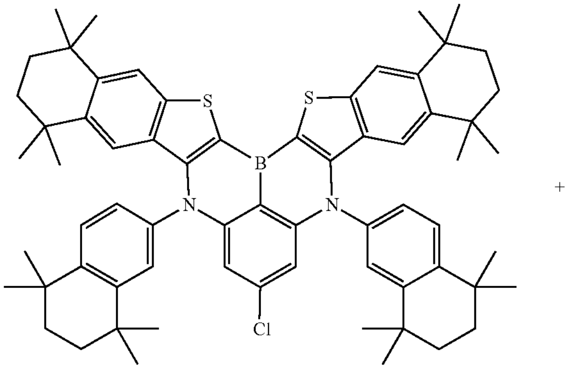

57

-continued

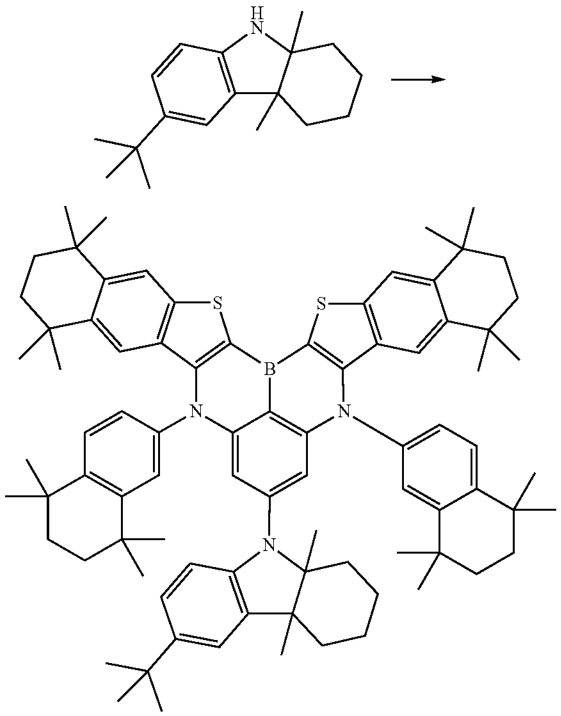

C-22

After 7 g of Intermediate 57, 1.8 g of 6-(tert-butyl)-4a, 9a-dimethyl-2,3,4,4a,9,9a-hexahydro-1H-carbazole, 1.3 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.8 g of Compound 22 (C-22). (yield 80%). MS[M+H]+=1229

Synthesis Example 19. Synthesis of Compound 23

1) Synthesis of Intermediate 58

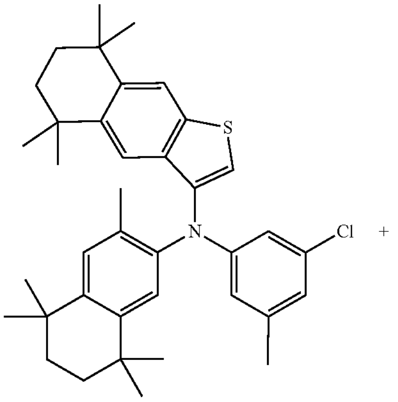

44

-continued

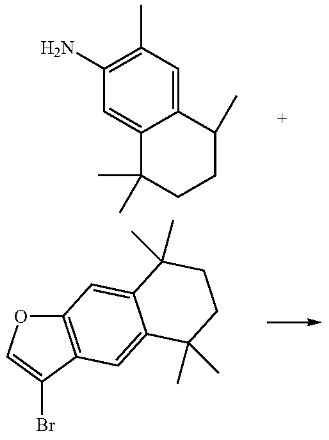

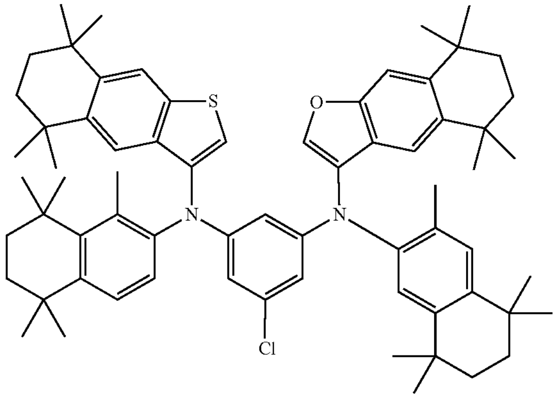

58

After 40 g of Intermediate 44, 14.9 g of 3,5,5,8,8-pentamethyl-5,6,7,8-tetrahydronaphthalen-2-amine, 0.4 g of bis(tri-tert-butylphosphine)palladium(0), and 17 g of sodium-tert-butoxide were put into 600 ml of toluene under a nitrogen atmosphere, the resulting mixture was stirred under reflux for 1 hour. Thereafter, whether the reaction proceeded was confirmed, and then 21 g of 3-bromo-5,5,8,8-tetramethyl-5,6,7,8-tetrahydronaphtho[2,3-b]furan was introduced thereinto during the stirring, and then the resulting mixture was stirred under reflux for 4 hours. After the completion of the reaction, the resulting product was extracted, and then recrystallized to obtain 55 g of Intermediate 58. (yield 79%). MS[M+H]+=1013

2) Synthesis of Intermediate 59

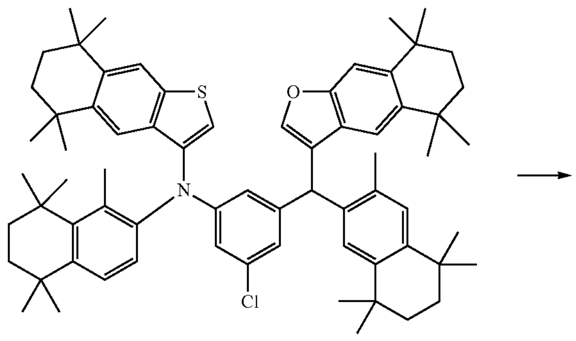

58

-continued

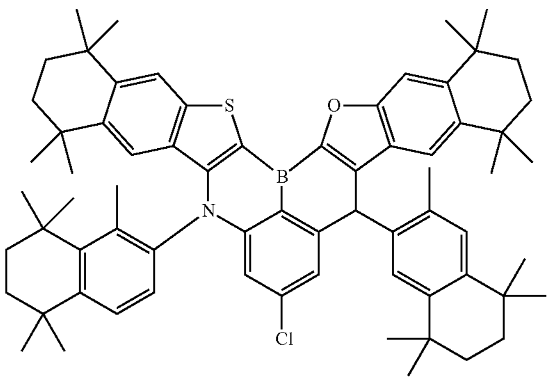

59

After 25 g of Intermediate 58 and 16.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.1 g of Intermediate 59 (yield 28%). MS[M+H]+=1020

3) Synthesis of Compound 23

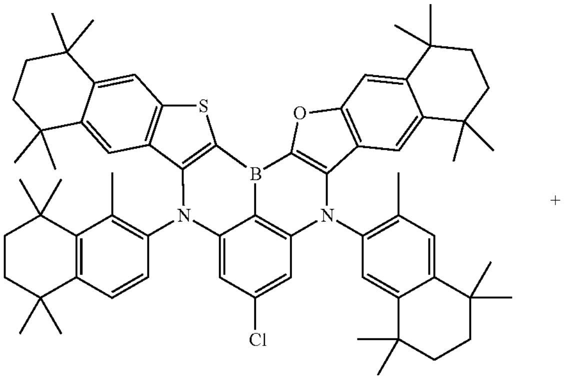

59

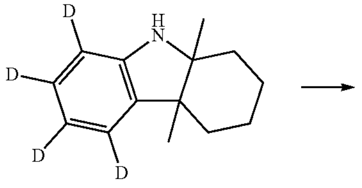

-continued

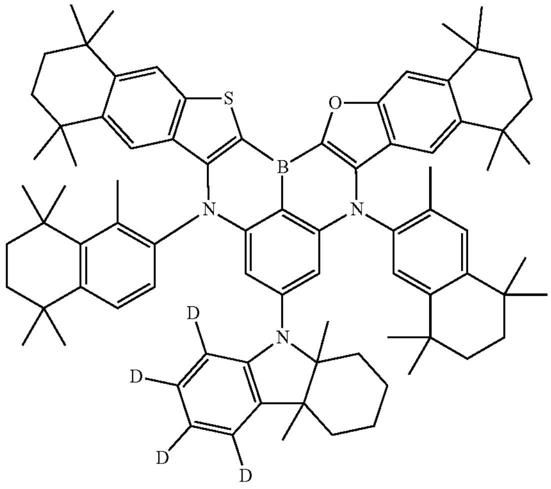

C-23

After 7 g of Intermediate 59, 1.6 g of 4a,9a-dimethyl-2,3,4,4a,9,9a-hexahydro-1H-carbazole-5,6,7,8-d4, 1.3 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.4 g of Compound 23 (C-23). (yield 78%). MS[M+H]+=1190

Synthesis Example 20. Synthesis of Compound 24

1) Synthesis of Intermediate 60

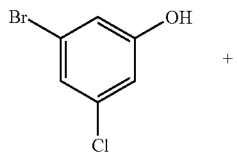

A4

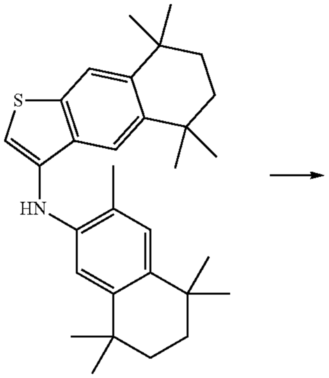

-continued

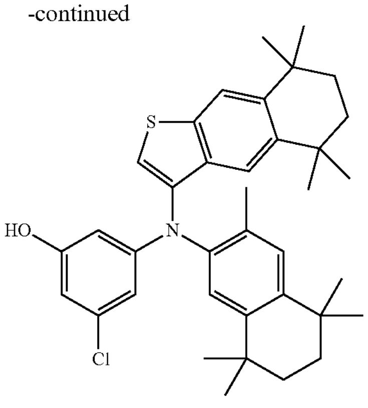

60

After 40 g of 3-bromo-5-chlorophenol (A4), 88.6 g of 5,5,8,8-tetramethyl-N-(3,5,5,8,8-pentamethyl-5,6,7,8-tetrahydronaphthalen-2-yl)-5,6,7,8-tetrahydronaphtho[2,3-b]thiophen-3-amine, 55.6 g of sodium-tert-butoxide, and 1 g of bis(tri-tert-butylphosphine)palladium(0) were put into 600 ml of toluene, the resulting mixture was stirred under reflux for 2 hours. After the completion of the reaction, the resulting product was extracted, and then recrystallized to obtain 80 g of Intermediate 60. (yield 71%). MS[M+H]+=587

2) Synthesis of Intermediate 61

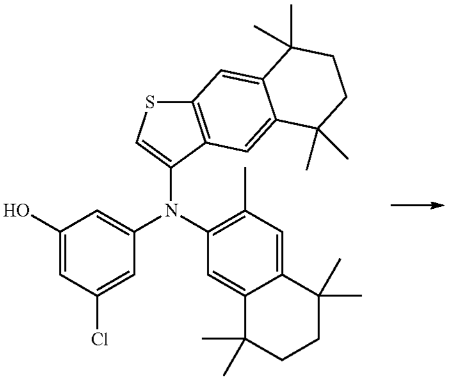

60

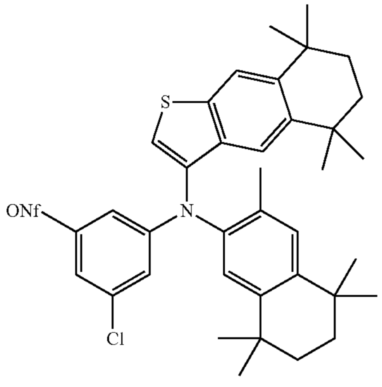

61

After 40 g of intermediate 60, 18.4 ml of 1,1,2,2,3,3,4,4,4-nonafluorobutane-1-sulfonyl fluoride, and 29 g of potassium carbonate were put into 400 ml of tetrahydrofuran and 200 ml of water, the resulting mixture was reacted for 3 hours, and then the resulting product was extracted after the completion of the reaction, and then the solution was removed to obtain 54 g of Intermediate 61. (yield 91%). MS[M+H]+=869

3) Synthesis of Intermediate 62

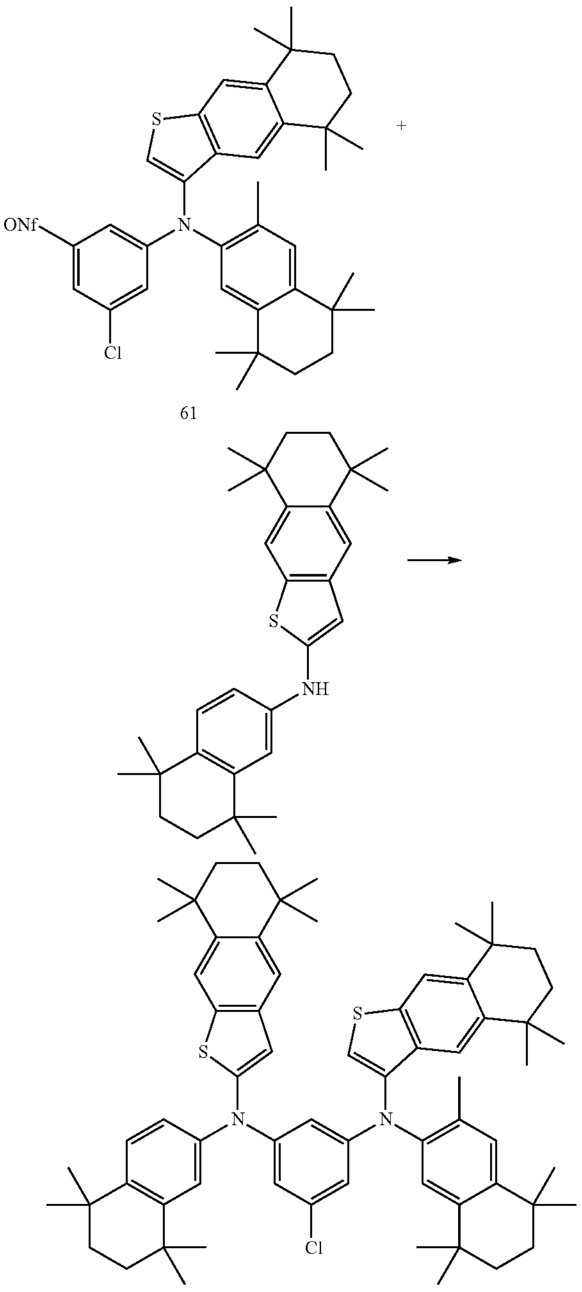

61

62

After 40 g of Intermediate 61, 20.5 g of 5,5,8,8-tetramethyl-N-(5,5,8,8-tetramethyl-5,6,7,8-tetrahydronaphthalen-2-yl)-5,6,7,8-tetrahydronaphtho[2,3-b]thiophen-2-amine, 0.80 g of Pd(dba)2, 1.31 g of Xphos, and 45.1 g of cesium carbonate were put into 500 ml of xylene under a nitrogen atmosphere, the resulting mixture was stirred under reflux for 24 hours. After the completion of the reaction, the resulting product was extracted, and then recrystallized to obtain 37 g of Intermediate 62. (yield 79%). MS[M+H]+=1015

4) Synthesis of Intermediate 63

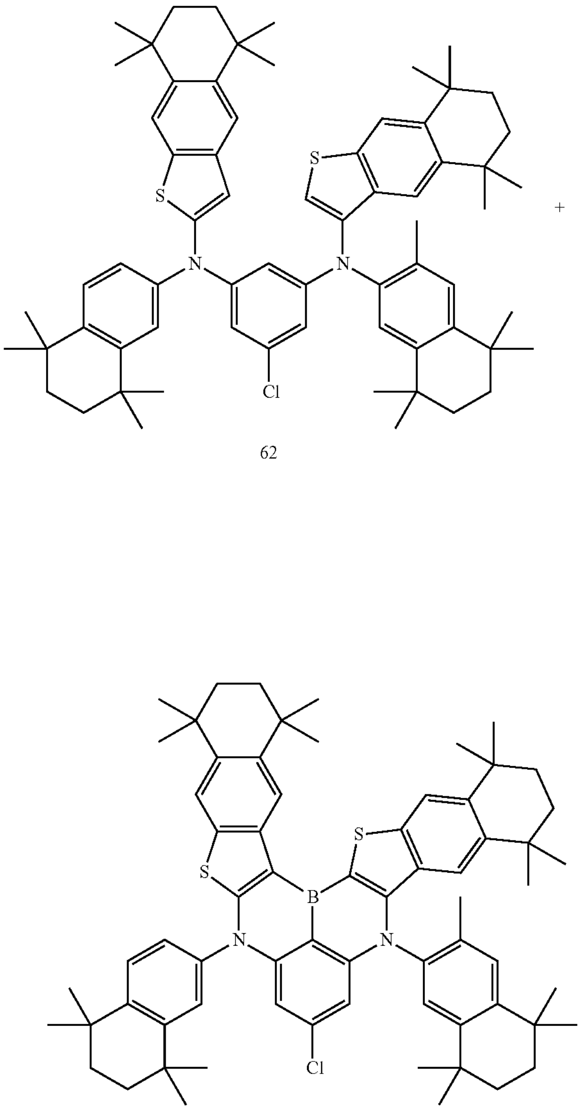

62

63

After 25 g of Intermediate 62 and 16.4 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.4 g of Intermediate 63 (yield 29%). MS[M+H]+=1023

5) Synthesis of Compound 24

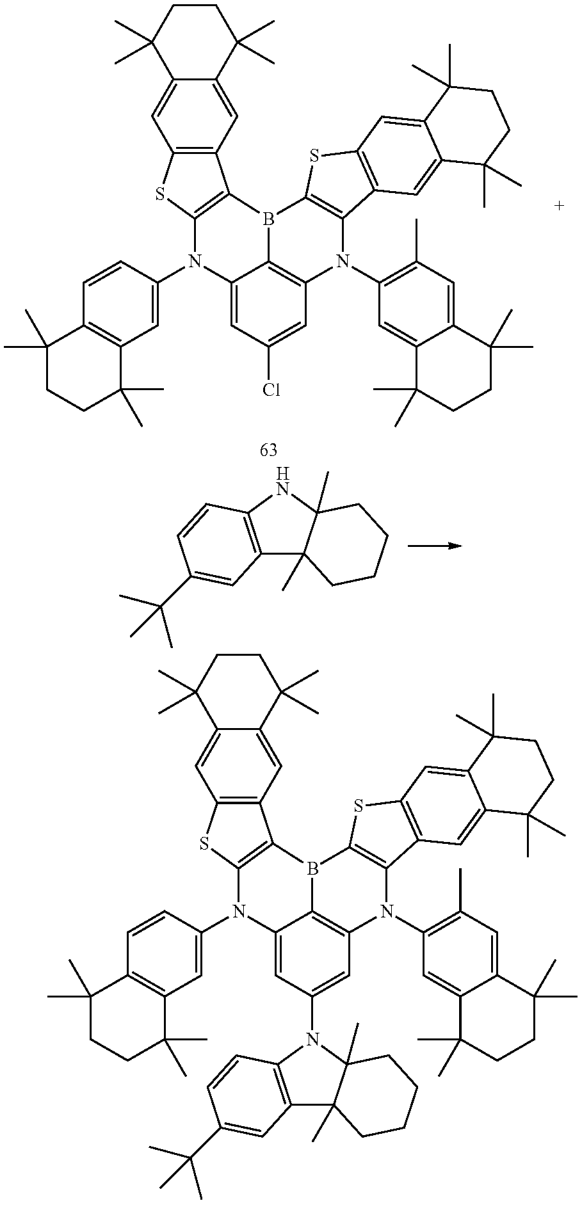

63

C-24

After 7 g of Intermediate 63, 1.8 g of 6-(tert-butyl)-4a, 9a-dimethyl-2,3,4,4a,9,9a-hexahydro-1H-carbazole, 1.3 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.5 g of Compound 24 (C-24). (yield 76%). MS[M+H]+=1244

Synthesis Example 21. Synthesis of Compound 25

1) Synthesis of Intermediate 64

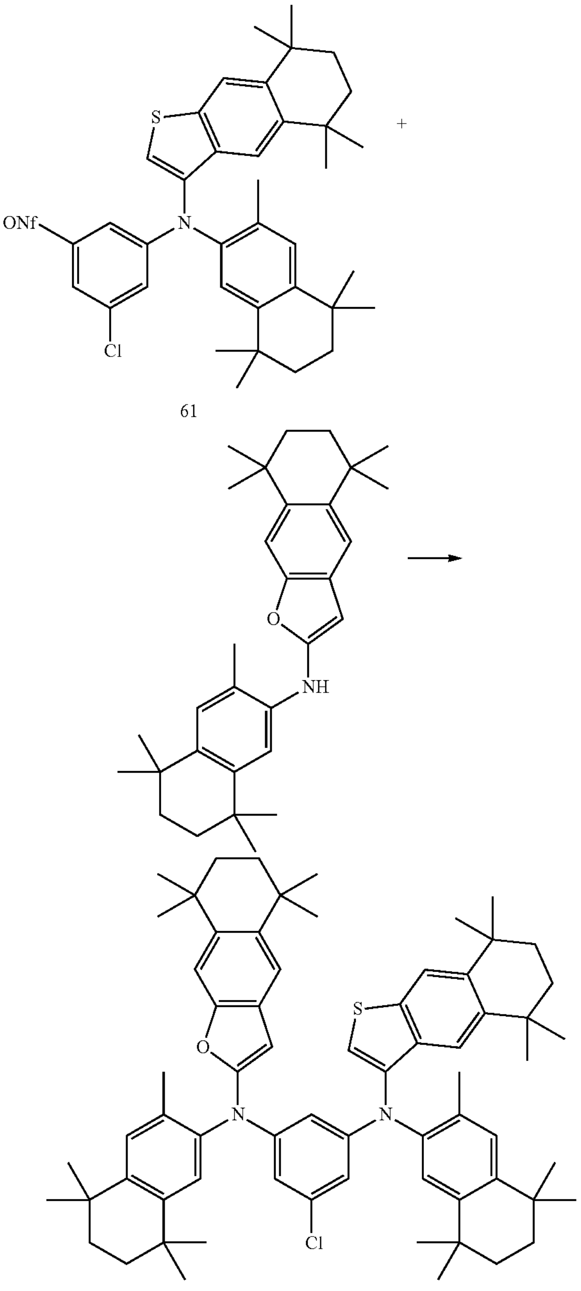

61

64

After 40 g of Intermediate 61, 20.4 g of 5,5,8,8-tetramethyl-N-(3,5,5,8,8-pentamethyl-5,6,7,8-tetrahydronaphthalen-2-yl)-5,6,7,8-tetrahydronaphtho[2,3-b]furan-2-amine, 0.80 g of Pd(dba)2, 1.31 g of Xphos, and 45.1 g of cesium carbonate were put into 500 ml of xylene under a nitrogen atmosphere, the resulting mixture was stirred under reflux for 24 hours. After the completion of the reaction, the resulting product was extracted, and then recrystallized to obtain 38 g of Intermediate 64 (yield 82%). MS[M+H]+=1013

2) Synthesis of Intermediate 65

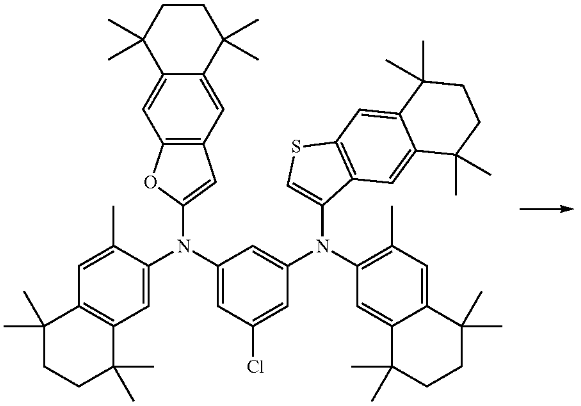

64

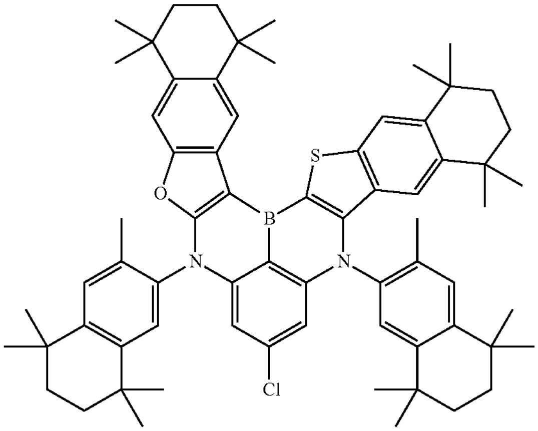

65

After 25 g of Intermediate 64 and 16.4 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.3 g of Intermediate 65 (yield 29%). MS[M+H]+=1021

3) Synthesis of Compound 25

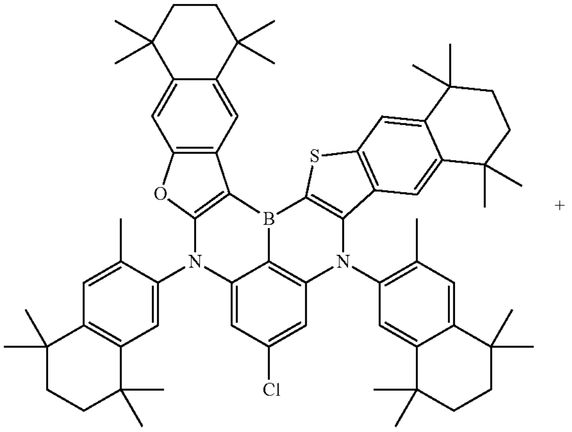

65

-continued

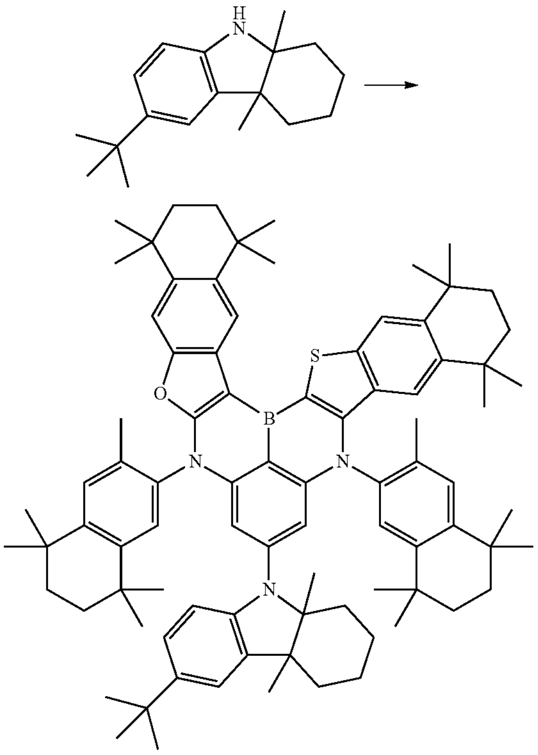

C-25

After 7 g of Intermediate 65, 1.4 g of 6-(tert-butyl)-4a, 9a-dimethyl-2,3,4,4a,9,9a-hexahydro-1H-carbazole, 1.4 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.3 g of Compound 25 (C-25). (yield 74%). MS[M+H]+=1242

Synthesis Example 22. Synthesis of Compound 26

1) Synthesis of Intermediate 66

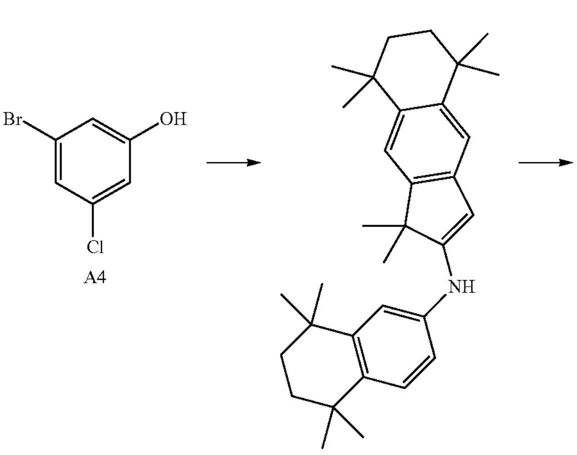

A4

-continued

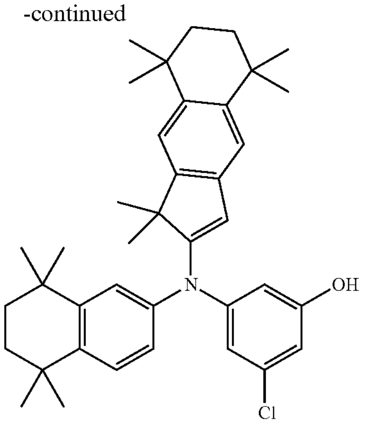

66

After 40 g of 3-bromo-5-chlorophenol (A4), 87.9 g of 1,1,5,5,8,8-hexamethyl-N-(5,5,8,8-tetramethyl-5,6,7,8-tetrahydronaphthalen-2-yl)-5,6,7,8-tetrahydro-1H-cyclopenta[b]naphthalen-2-amine, 55.6 g of sodium-tert-butoxide, and 1 g of bis(tri-tert-butylphosphine)palladium(0) were put into 600 ml of toluene, the resulting mixture was stirred under reflux for 2 hours. After the completion of the reaction, the resulting product was extracted, and then recrystallized to obtain 79 g of Intermediate 66. (yield 70%). MS[M+H]+=583

2) Synthesis of Intermediate 67

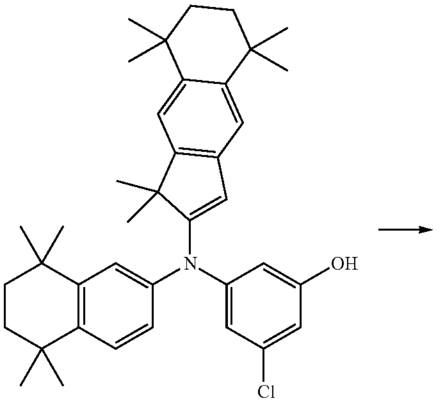

66

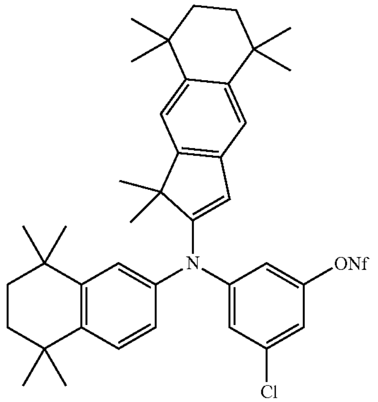

67

After 40 g of intermediate 66, 18.5 ml of 1,1,2,2,3,3,4,4,4-nonafluorobutane-1-sulfonyl fluoride, and 29 g of potassium carbonate were put into 400 ml of tetrahydrofuran and 200 ml of water, the resulting mixture was reacted for 3 hours, and then the resulting product was extracted after the completion of the reaction, and then the solution was removed to obtain 55 g of Intermediate 67. (yield 93%). MS[M+H]+=866

3) Synthesis of Intermediate 68

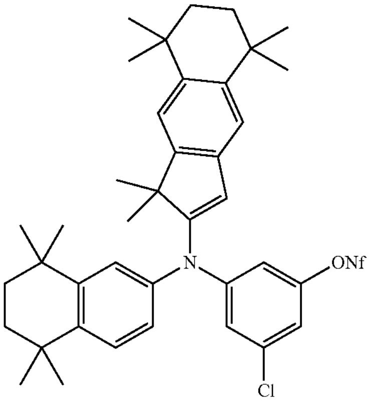

67

+

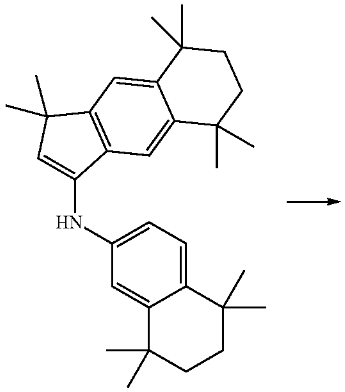

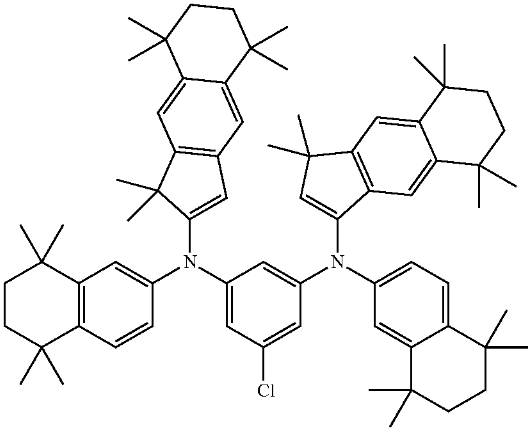

68

After 40 g of Intermediate 67, 21.1 g of 1,1,5,5,8,8-hexamethyl-N-(5,5,8,8-tetramethyl-5,6,7,8-tetrahydronaphthalen-2-yl)-5,6,7,8-tetrahydro-1H-cyclopenta[b]naphthalen-3-amine, 0.80 g of Pd(dba)2, 1.31 g of Xphos, and 45.2 g of cesium carbonate were put into 600 ml of xylene under a nitrogen atmosphere, the resulting mixture was stirred under reflux for 24 hours. After the completion of the reaction, the resulting product was extracted, and then recrystallized to obtain 36 g of Intermediate 68 (yield 76%). MS[M+H]+=1021

4) Synthesis of Intermediate 69

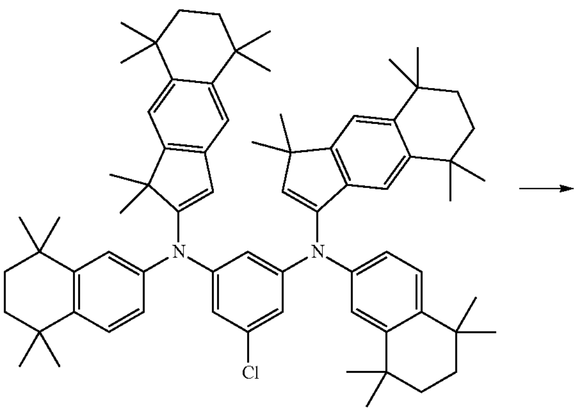

68

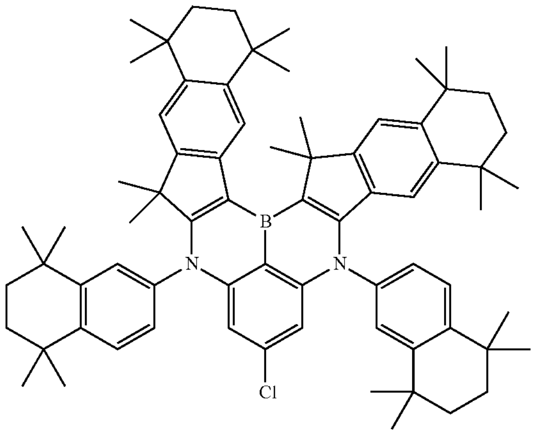

69

After 25 g of Intermediate 68 and 16.3 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.2 g of Intermediate 69 (yield 29%). MS[M+H]+=1029

5) Synthesis of Compound 26

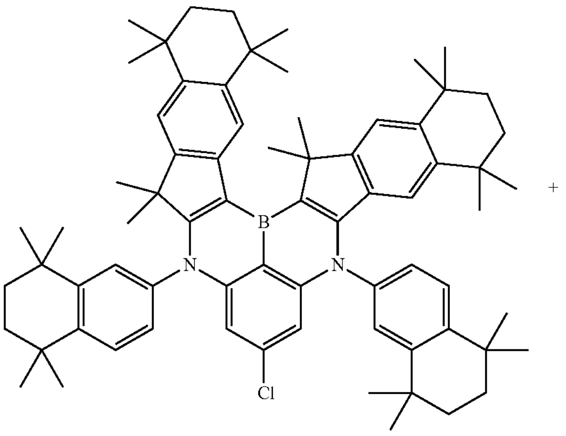

69

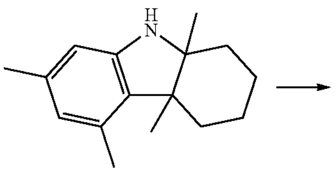

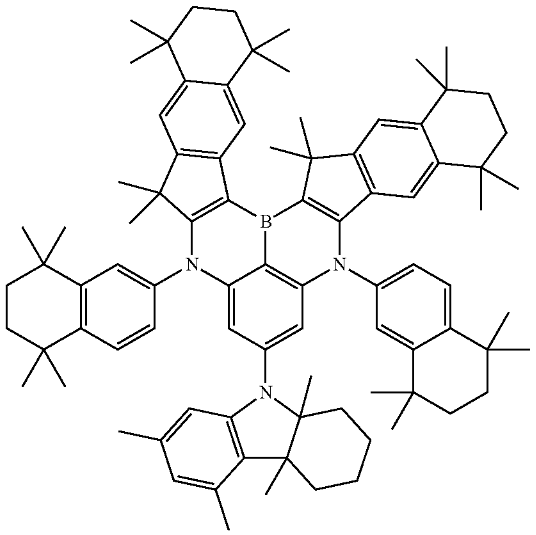

C-26

After 7 g of Intermediate 69, 1.6 g of 4a,5,7,9a-tetramethyl-2,3,4,4a,9,9a-hexahydro-1H-carbazole, 1.3 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.4 g of Compound 26 (C-26). (yield 77%). MS[M+H]+=1221

Synthesis Example 23. Synthesis of Compound 27

1) Synthesis of Intermediate 70

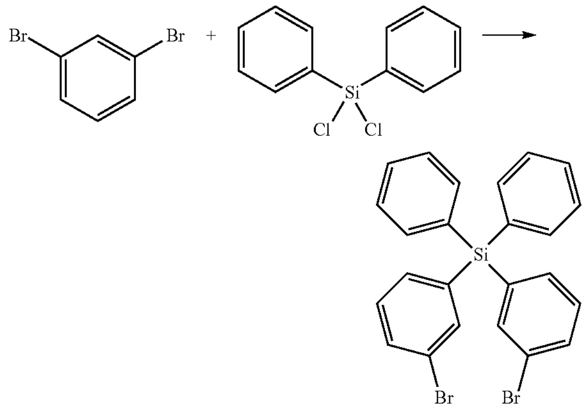

70

10 g of 1,3-dibromobenzene was dissolved in 100 mL of diethyl ether, and the resulting solution was cooled to −78° C. under nitrogen conditions. Next, 26 mL of a 1.6 M n-BuLi hexane solution was slowly added dropwise thereto, and the resulting solution was stirred at −78° C. for 2 hours. 5.10 g of dichlorodiphenylsilane was put thereinto, and the resulting mixture was slowly stirred under reflux at room temperature for 10 hours. The reaction was terminated by putting distilled water thereinto, 100 mL of diethyl ether was further put thereinto for extraction, and then the extract was dried over anhydrous sodium sulfate. Thereafter, the residue was column purified to obtain 5.0 g of Intermediate 70. MS[M+H]+=494

2) Synthesis of Intermediate 71

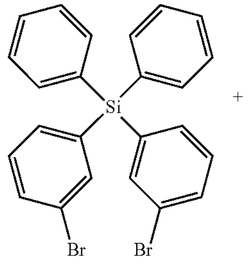

70

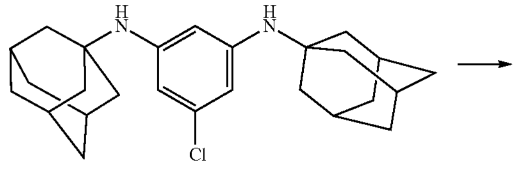

-continued

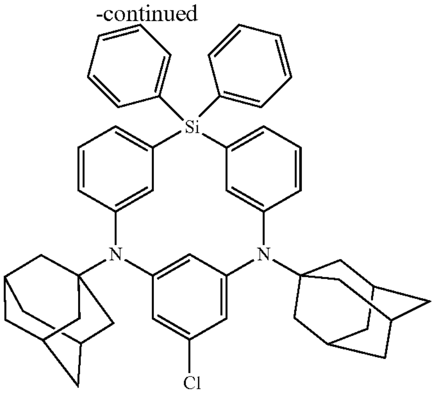

71

After 40 g of Intermediate 70, 33.3 g of N1-((1S,3S)-adamantan-1-yl)-N3-((3R,5R,7R)-adamantan-1-yl)-5-chlorobenzene-1,3-diamine, 0.5 g of bis(tri-tert-butylphosphine) palladium(0), and 19.4 g of sodium-tert-butoxide were put into 700 ml of xylene, the resulting mixture was stirred under reflux for 4 hours. Thereafter, the resulting product was column purified to obtain 10 g of Intermediate 71. MS[M+H]+=744

3) Synthesis of Intermediate 72

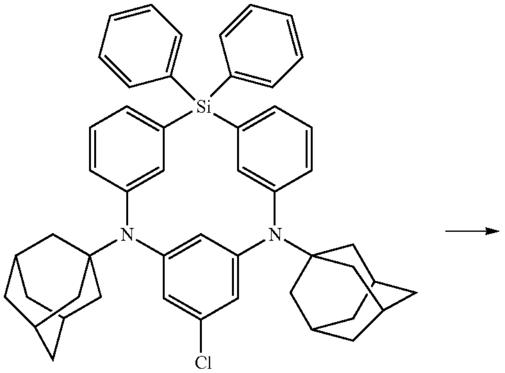

71

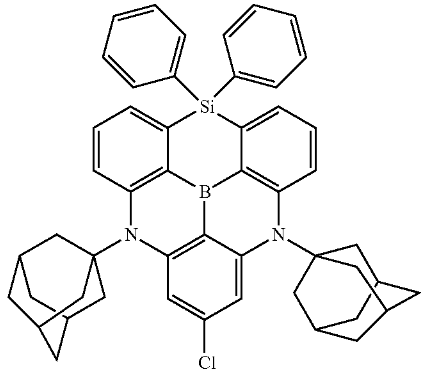

72

After 25 g of Intermediate 71 and 22.4 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.2 g of Intermediate 72 (yield 29%). MS[M+H]+=752

4) Synthesis of Compound 27

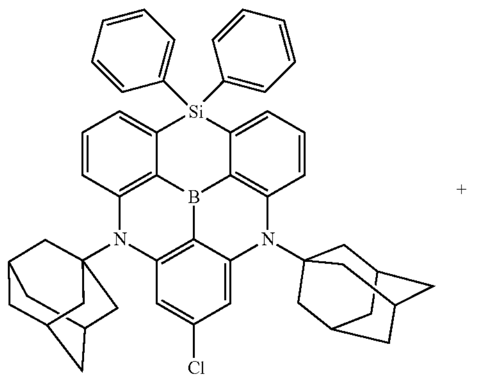

72

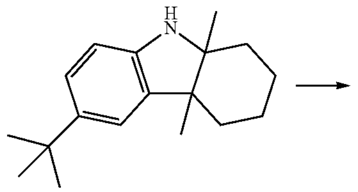

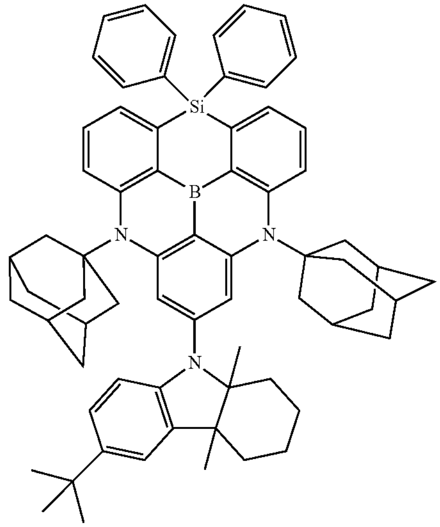

C-27

After 7 g of Intermediate 72, 2.4 g of 6-(tert-butyl)-4a,9a-dimethyl-2,3,4,4a,9,9a-hexahydro-1H-carbazole, 1.8 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 27 (C-27). (yield 73%). MS[M+H]+=973

Synthesis Example 24. Synthesis of Compound 28

1) Synthesis of Intermediate 73

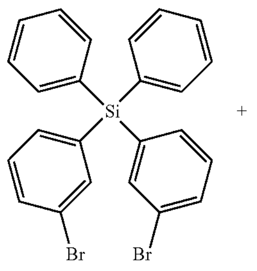

70

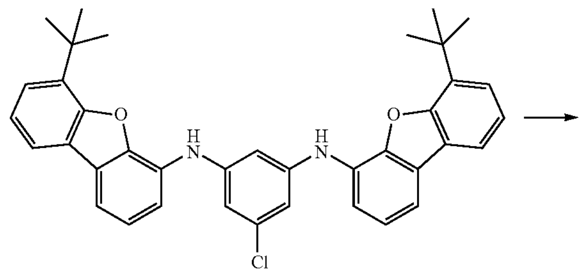

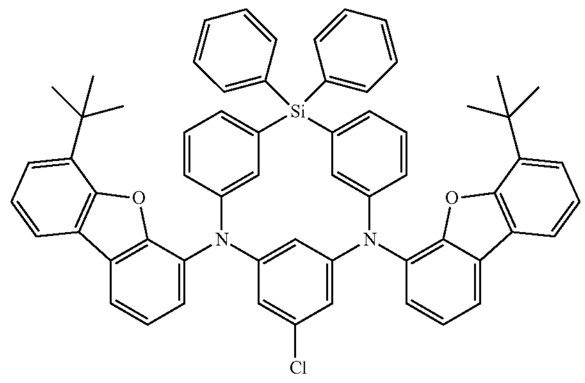

73

After 40 g of Intermediate 70, 47.5 g of N1,N3-bis(6-(tert-butyl)dibenzo[b,d]furan-4-yl)-5-chlorobenzene-1,3-diamine, 0.5 g of bis(tri-tert-butylphosphine)palladium(0), and 19.4 g of sodium-tert-butoxide were put into 700 ml of xylene, the resulting mixture was stirred under reflux for 4 hours. Thereafter, the resulting product was column purified to obtain 11 g of Intermediate 73. MS[M+H]+=920

2) Synthesis of Intermediate 74

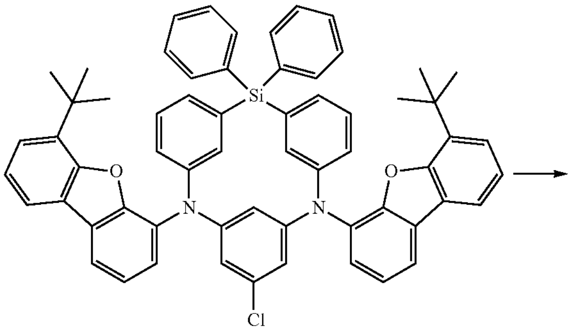

73

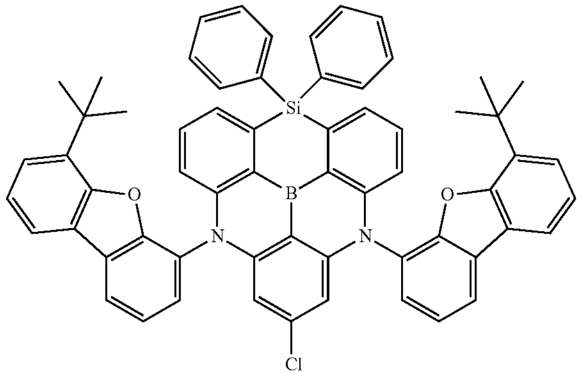

74

After 25 g of Intermediate 73 and 18.1 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.1 g of Intermediate 74 (yield 28%). MS[M+H]+=928

3) Synthesis of Compound 28

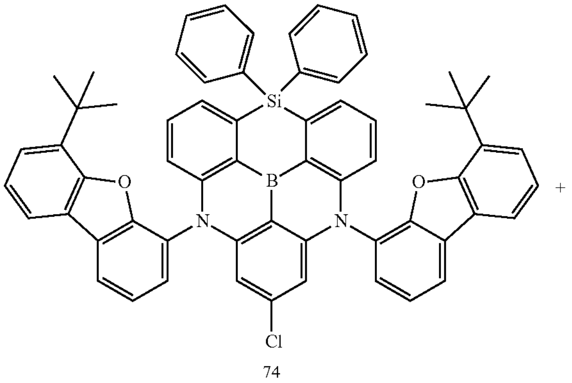

74

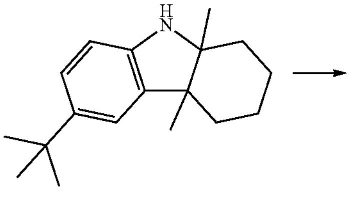

-continued

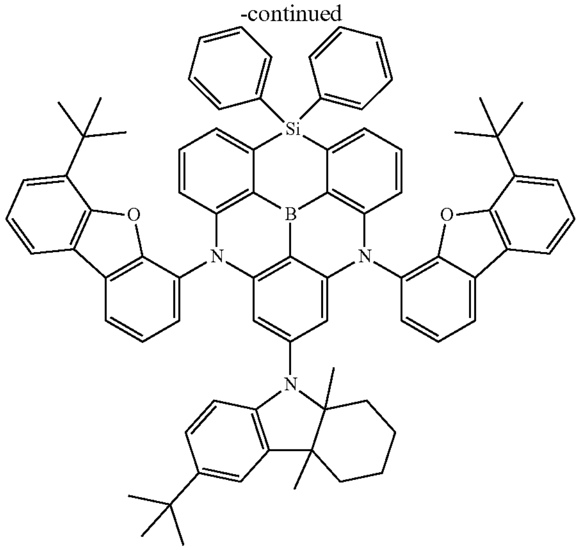

C-28

After 7 g of Intermediate 74, 2.0 g of 6-(tert-butyl)-4a,9a-dimethyl-2,3,4,4a,9,9a-hexahydro-1H-carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.7 g of Compound 28 (C-28). (yield 77%). MS[M+H]+=1149

Synthesis Example 25. Synthesis of Compound 29

1) Synthesis of Intermediate 75

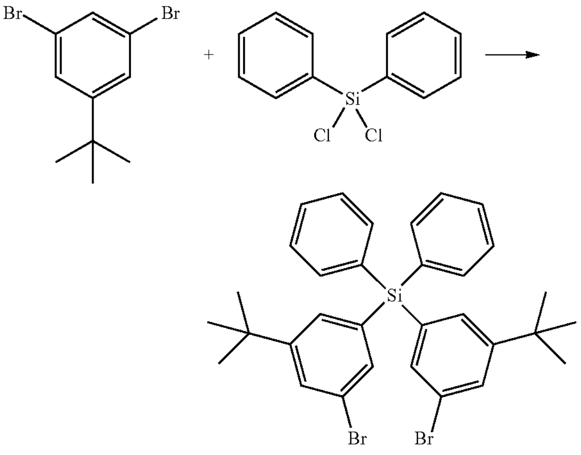

75

10 g of 1,3-dibromo-5-(tert-butyl)benzene was dissolved in 100 mL of diethyl ether, and the resulting solution was cooled to −78° C. under nitrogen conditions. Next, 24 mL of a 1.6 M n-BuLi hexane solution was slowly added dropwise thereto, and the resulting solution was stirred at −78° C. for 2 hours. 4.9 g of dichlorodiphenylsilane was put thereinto, and the resulting mixture was slowly stirred under reflux at room temperature for 10 hours. The reaction was terminated by putting distilled water thereinto, 100 mL of diethyl ether was further put thereinto for extraction, and the extract was dried over anhydrous sodium sulfate. Thereafter, the residue was column purified to obtain 5.1 g of Intermediate 75. MS[M+H]+=607

2) Synthesis of Intermediate 76

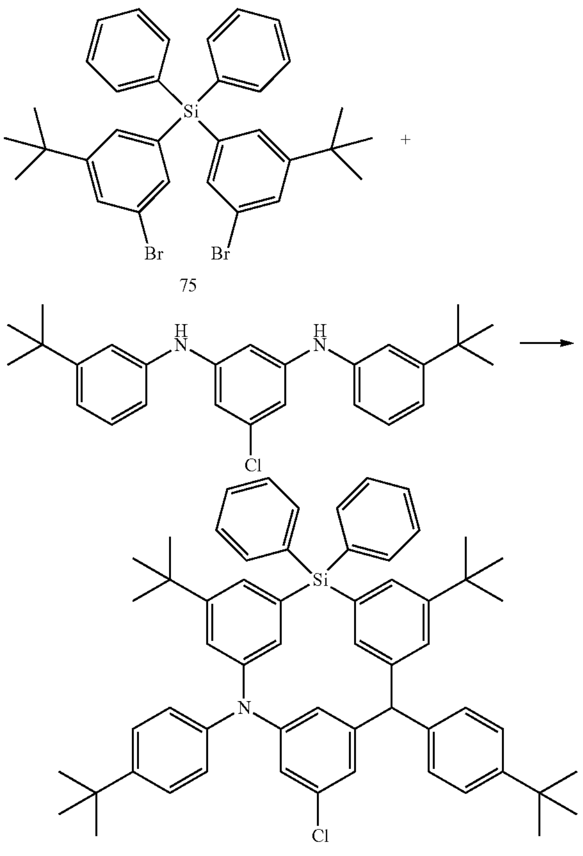

75

76

After 40 g of Intermediate 75, 38.6 g of N1,N3-bis(3-(tert-butyl)phenyl)-5-chlorobenzene-1,3-diamine, 0.4 g of bis(tri-tert-butylphosphine)palladium(0), and 15.9 g of sodium-tert-butoxide were put into 700 ml of xylene, the resulting mixture was stirred under reflux for 4 hours. Thereafter, the resulting product was column purified to obtain 12 g of Intermediate 76. MS[M+H]+=852

3) Synthesis of Intermediate 77

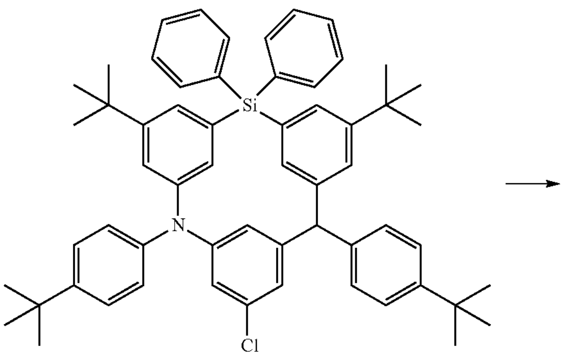

76

-continued

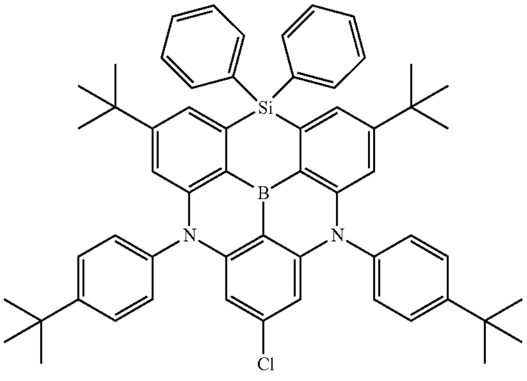

77

After 25 g of Intermediate 76 and 19.5 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.1 g of Intermediate 77 (yield 28%). MS[M+H]+=860

4) Synthesis of Compound 29

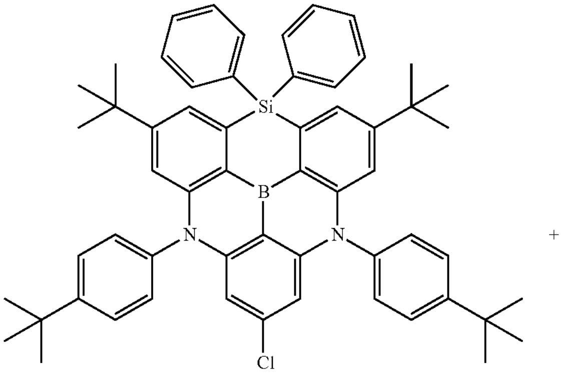

77

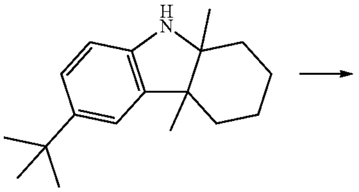

-continued

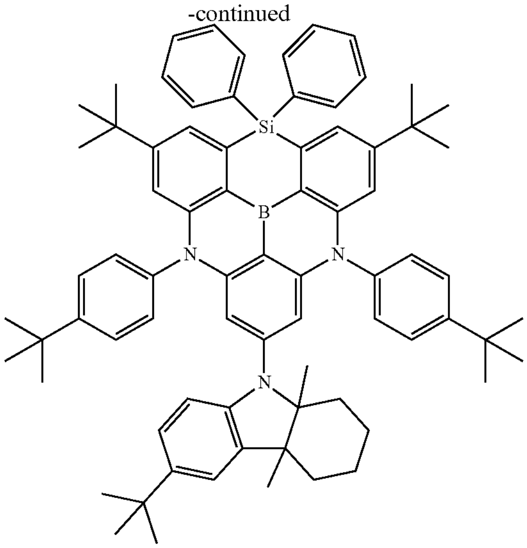

C-29

After 7 g of Intermediate 77, 2.1 g of 6-(tert-butyl)-4a, 9a-dimethyl-2,3,4,4a,9,9a-hexahydro-1H-carbazole, 1.6 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.8 g of Compound 29 (C-29). (yield 77%). MS[M+H]+=1081

Synthesis Example 26. Synthesis of Compound 30

1) Synthesis of Intermediate 78

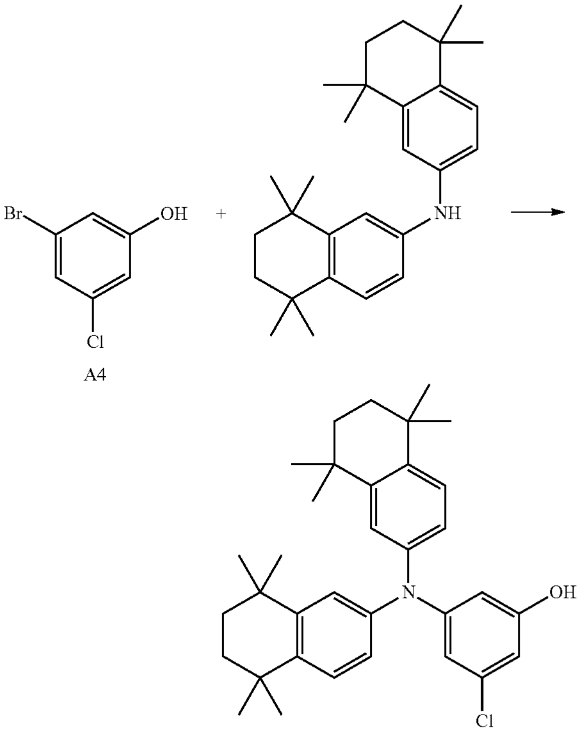

A4

78

After 40 g of 3-bromo-5-chlorophenol (A4), 75.2 g of bis(5,5,8,8-tetramethyl-5,6,7,8-tetrahydronaphthalen-2-yl) amine, 46.3 g of sodium-tert-butoxide, and 1 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 77 g of Intermediate 78. (yield 77%). MS[M+H]+=517

2) Synthesis of Intermediate 79

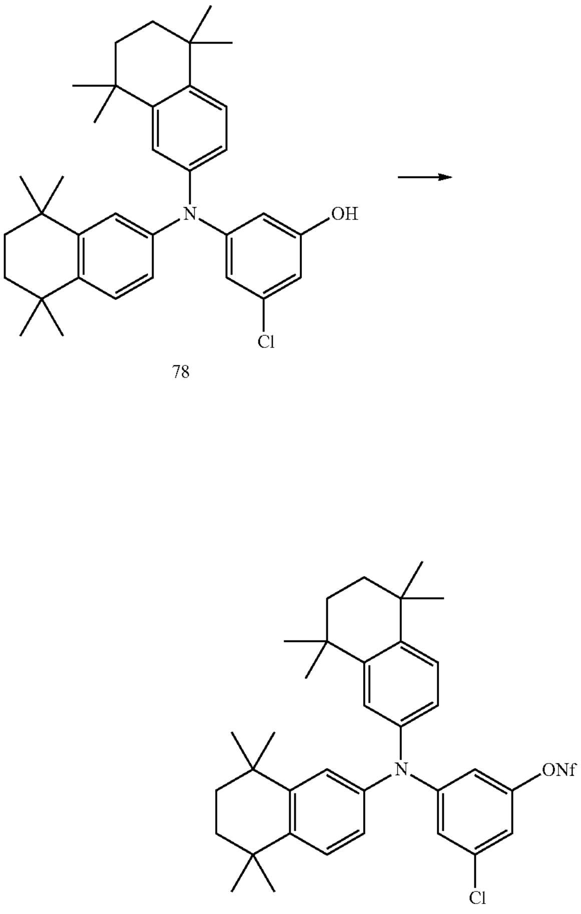

78

79

After 40 g of intermediate 78, 21 ml of 1,1,2,2,3,3,4,4,4-nonafluorobutane-1-sulfonyl fluoride, and 32 g of potassium carbonate were put into 400 ml of tetrahydrofuran and 200 ml of water, the resulting mixture was reacted for 3 hours, and then the resulting product was extracted after the completion of the reaction, and then the solution was removed to obtain 58 g of Intermediate 79. (yield 98%). MS[M+H]+=799

3) Synthesis of Intermediate 80

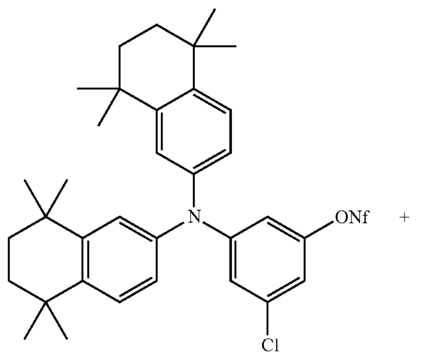

79

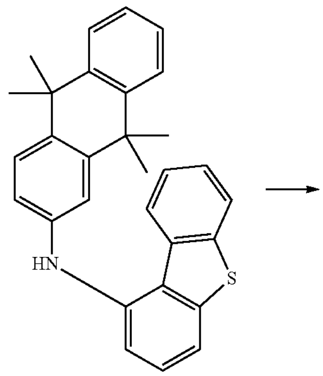

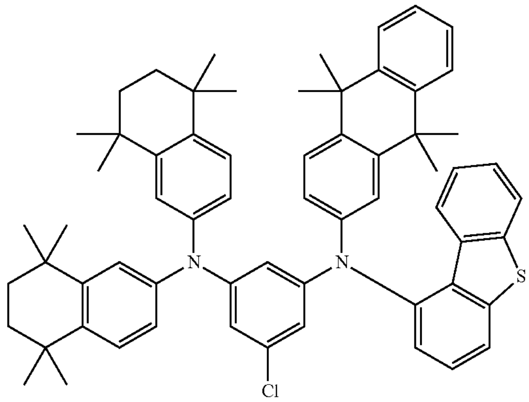

80

After 40 g of Intermediate 79, 21.8 g of N-(9,9,10,10-tetramethyl-9,10-dihydroanthracen-2-yl)-dibenzo[b,d]thiophen-2-amine, 0.9 g of Pd(dba)2, 1.4 g of Xphos, and 49 g of cesium carbonate were put into 600 ml of xylene under a nitrogen atmosphere, the resulting mixture was stirred under reflux for 24 hours. After the completion of the reaction, the resulting product was extracted, and then recrystallized to obtain 35 g of Intermediate 80 (yield 75%). MS[M+H]+=932

4) Synthesis of Intermediate 81

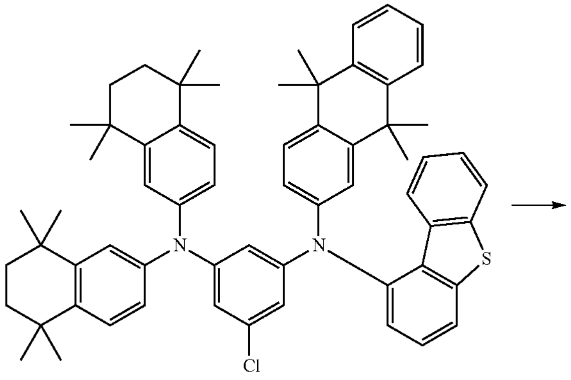

80

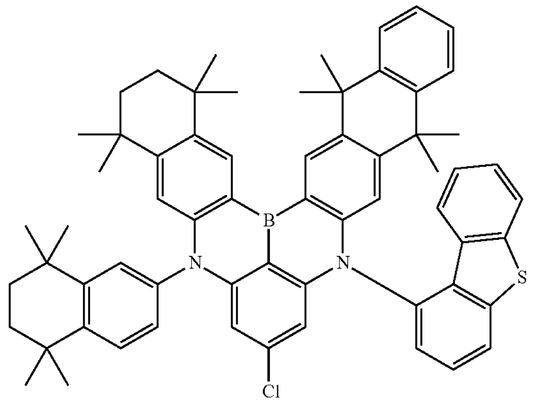

81

After 25 g of Intermediate 80 and 17.6 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.3 g of Intermediate 81 (yield 29%). MS[M+H]+=940

5) Synthesis of Compound 30

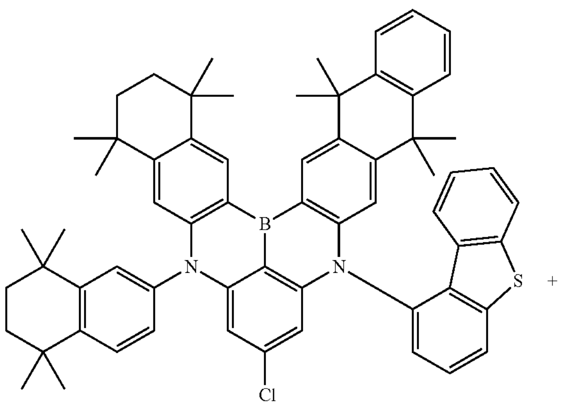

81

-continued

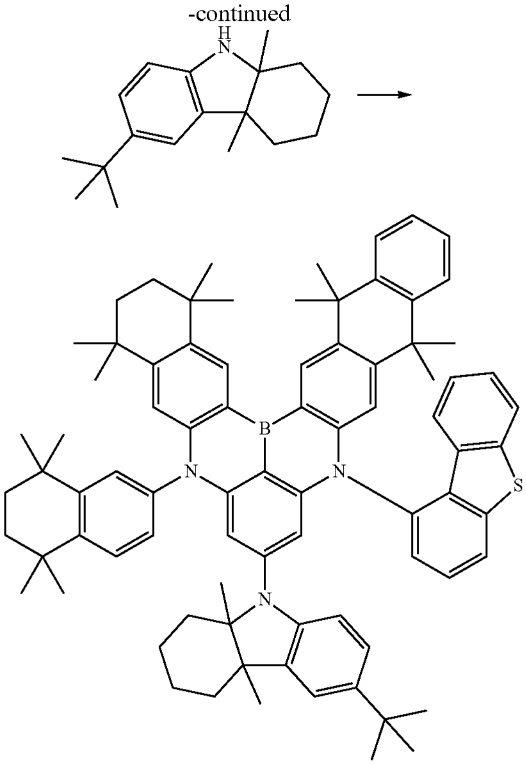

C-30

After 7 g of Intermediate 81, 1.9 g of 6-(tert-butyl)-4a, 9a-dimethyl-2,3,4,4a,9,9a-hexahydro-1H-carbazole, 1.4 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 30 (C-30). (yield 76%). MS[M+H]+=1161

Synthesis Example 27. Synthesis of Compound 31

1) Synthesis of Intermediate 82

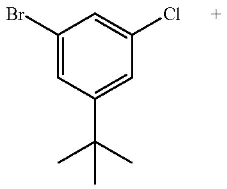

A5

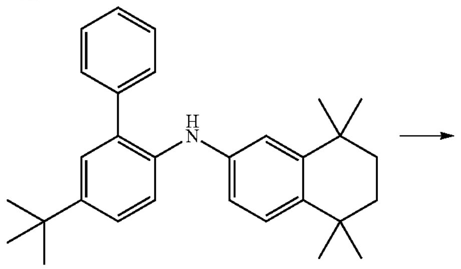

-continued

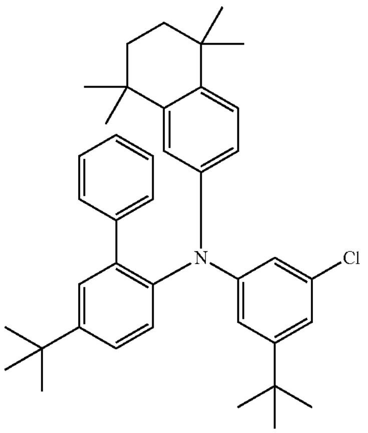

82

After 40 g of 1-bromo-3-(tert-butyl)-5-chlorobenzene (A5), 66.5 g of N-(5-(tert-butyl)-[1,1'-biphenyl]-2-yl)-5,5,8,8-tetramethyl-5,6,7,8-tetrahydronaphthalen-2-amine, 31.1 g of sodium-tert-butoxide, and 0.8 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 74 g of Intermediate 82. (yield 79%). MS[M+H]+=579

2) Synthesis of Intermediate 83

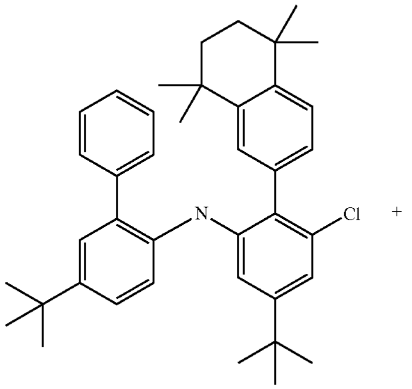

82

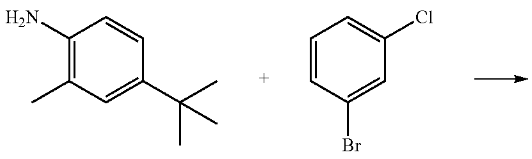

-continued

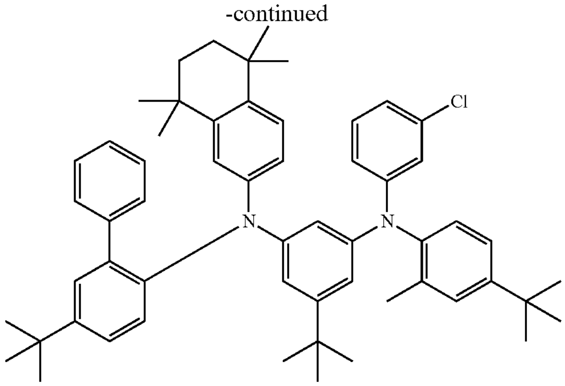

83

After 40 g of Intermediate 82, 11.3 g of 4-(tert-butyl)-2-methylaniline, 0.4 g of bis(tri-tert-butylphosphine)palladium(0), and 17 g of sodium-tert-butoxide were put into 600 ml of toluene under a nitrogen atmosphere, the resulting mixture was stirred under reflux for 1 hour. Thereafter, whether the reaction proceeded was confirmed, and then 13.2 g of 1-bromo-3-chlorobenzene was introduced thereinto during the stirring, and then the resulting mixture was stirred under reflux for 4 hours. After the completion of the reaction, the resulting product was extracted, and then recrystallized to obtain 43 g of Intermediate 83. (yield 76%). MS[M+H]+=816

3) Synthesis of Intermediate 84

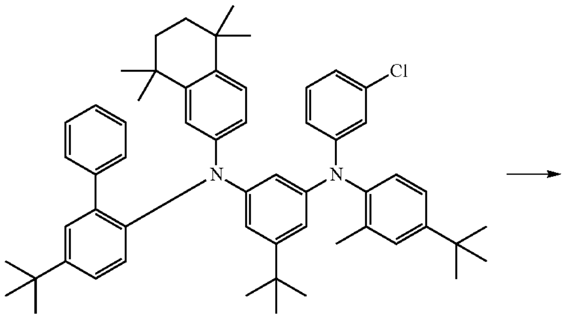

83

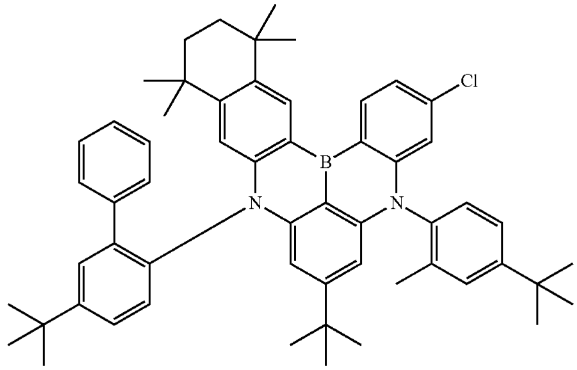

84

After 25 g of Intermediate 83 and 20.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 84 (yield 29%). MS[M+H]+=824

4) Synthesis of Compound 31

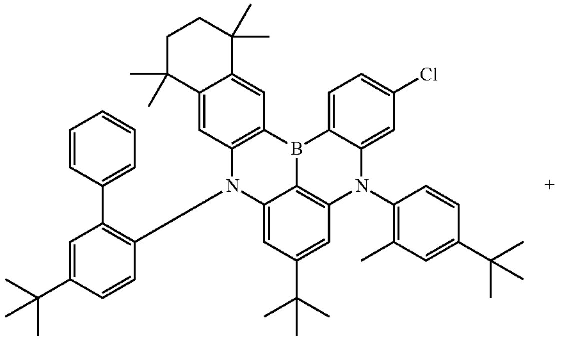

84

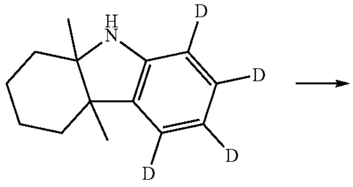

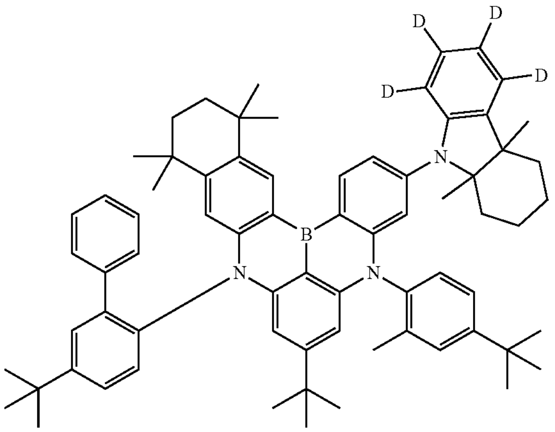

C-31

After 7 g of Intermediate 84, 1.8 g of 4a,9a-dimethyl-2,3,4,4a,9,9a-hexahydro-1H-carbazole-5,6,7,8-d4, 1.7 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.4 g of Compound 31 (C-31). (yield 76%). MS[M+H]+=993

Synthesis Example 28. Synthesis of Compound 32

1) Synthesis of Intermediate 85

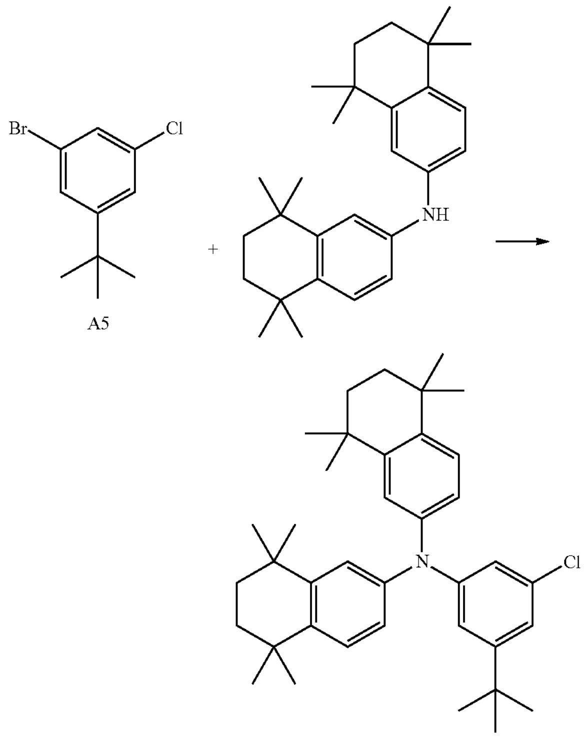

A5

85

After 40 g of 1-bromo-3-(tert-butyl)-5-chlorobenzene (A5), 63 g of bis(5,5,8,8-tetramethyl-5,6,7,8-tetrahydronaphthalen-2-yl)amine, 31.1 g of sodium-tert-butoxide, and 0.8 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 70 g of Intermediate 85. (yield 78%). MS[M+H]+=557

2) Synthesis of Intermediate 86

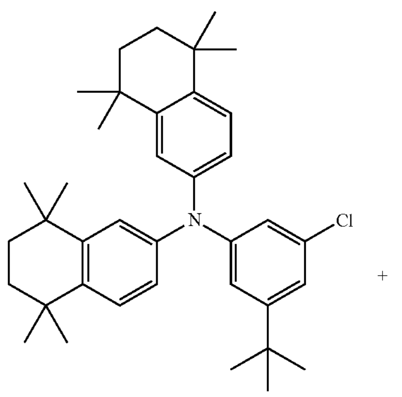

85

-continued

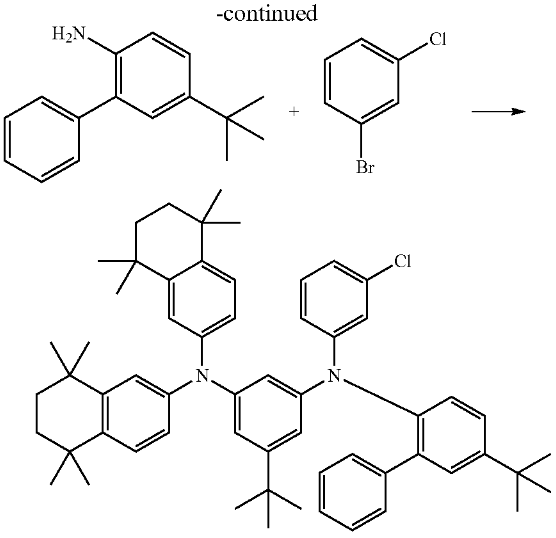

86

After 40 g of Intermediate 85, 15.6 g of 5-(tert-butyl)-[1,1'-biphenyl]-2-amine, 0.4 g of bis(tri-tert-butylphosphine)palladium(0), and 17 g of sodium-tert-butoxide were put into 600 ml of toluene under a nitrogen atmosphere, the resulting mixture was stirred under reflux for 1 hour. Thereafter, whether the reaction proceeded was confirmed, and then 13.2 g of 1-bromo-3-chlorobenzene was introduced thereinto during the stirring, and then the resulting mixture was stirred under reflux for 4 hours. After the completion of the reaction, the resulting product was extracted, and then recrystallized to obtain 44 g of Intermediate 86. (yield 74%). MS[M+H]+=856

3) Synthesis of Intermediate 87

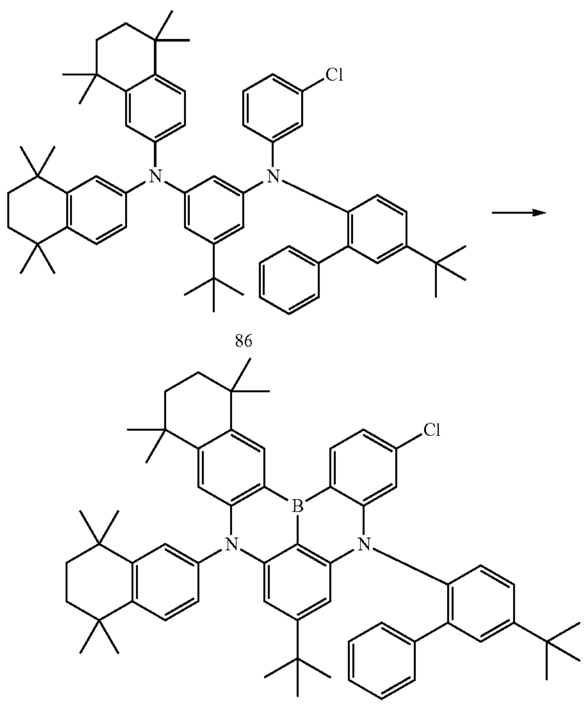

86

87

After 25 g of Intermediate 86 and 19.5 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 87 (yield 31%). MS[M+H]+=864

4) Synthesis of Compound 32

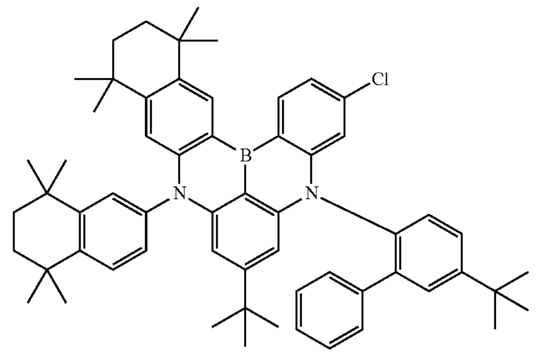

+

87

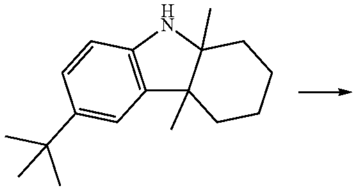

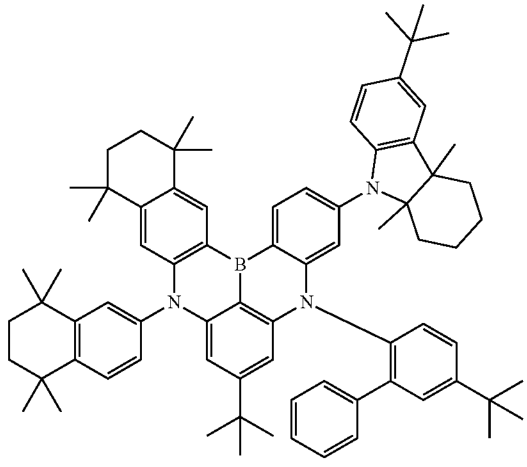

C-32

After 7 g of Intermediate 87, 2.1 g of 6-(tert-butyl)-4a,9a-dimethyl-2,3,4,4a,9,9a-hexahydro-1H-carbazole, 1.6 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.5 g of Compound 32 (C-32). (yield 74%). MS[M+H]+=1085

Synthesis Example 29. Synthesis of Compound 33

1) Synthesis of Compound 33

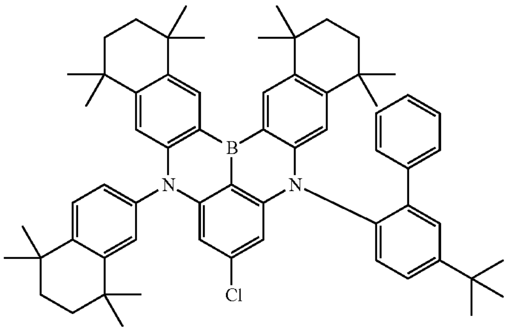

+

9

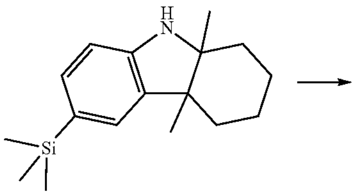

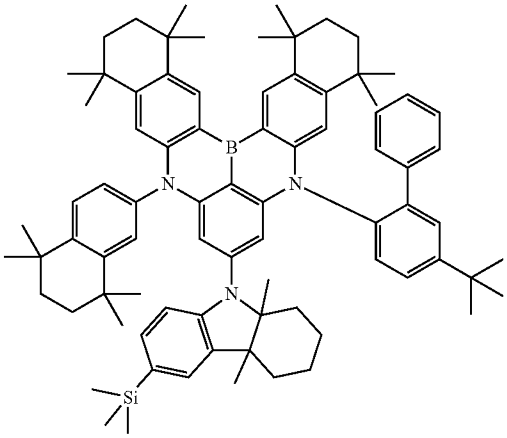

C-33

After 7 g of Intermediate 9, 2.1 g of 4a,9a-dimethyl-6-(trimethylsilyl)-2,3,4,4a,9,9a-hexahydro-1H-carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 33 (C-33). (yield 75%). MS[M+H]+=1156

Synthesis Example 30. Synthesis of Compound 34

1) Synthesis of Compound 34

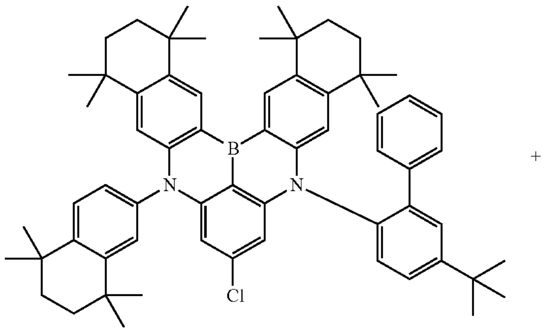

9

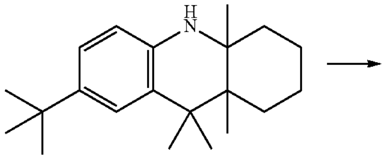

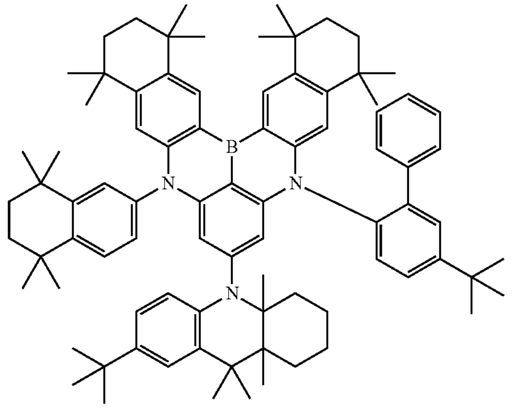

C-34

After 7 g of Intermediate 9, 2.3 g of 7-(tert-butyl)-4a,9,9,9a-tetramethyl-1,2,3,4,4a,9,9a,10-octahydroacridine, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.8 g of Compound 34 (C-34). (yield 75%). MS[M+H]+=1182

Synthesis Example 31. Synthesis of Compound 35

1) Synthesis of Compound 35

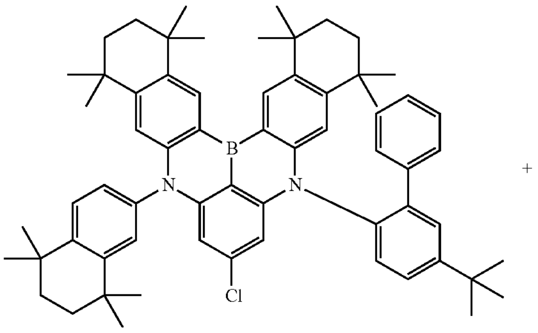

9

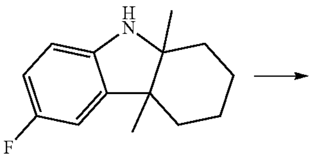

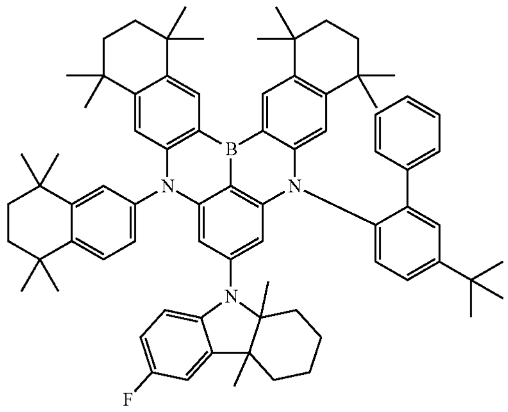

C-35

After 7 g of Intermediate 9, 1.7 g of 6-fluoro-4a,9a-dimethyl-2,3,4,4a,9,9a-hexahydro-1H-carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 35 (C-35). (yield 79%). MS[M+H]+=1101

Synthesis Example 32. Synthesis of Compound 36

1) Synthesis of Compound 36

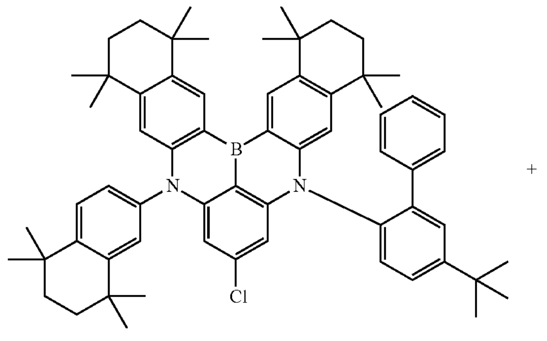

9

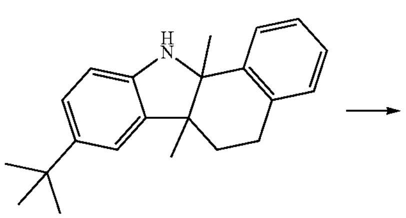

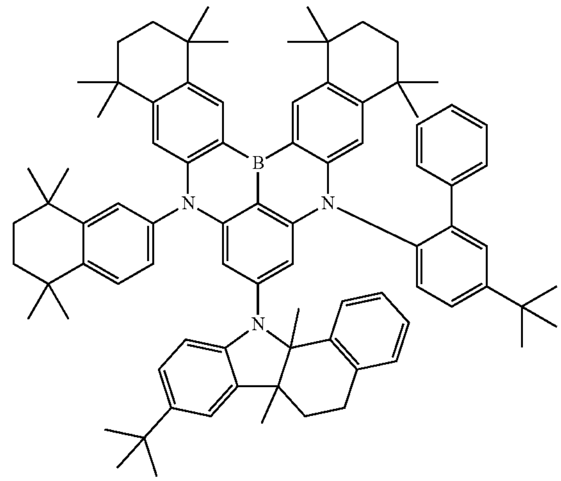

C-36

After 7 g of Intermediate 9, 2.4 g of 8-(tert-butyl)-6a,11a-dimethyl-6,6a,11,11a-tetrahydro-5H-benzo[a]carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.9 g of Compound 36 (C-36). (yield 76%). MS[M+H]+=1187

Synthesis Example 33. Synthesis of Compound 37

1) Synthesis of Intermediate 88

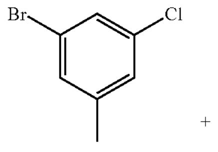

A2

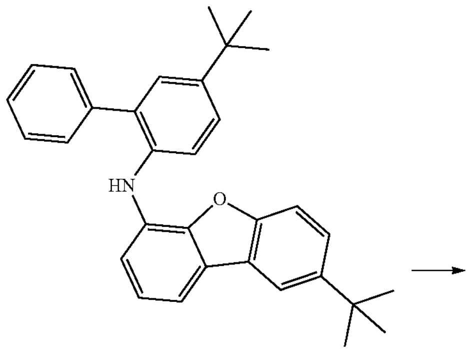

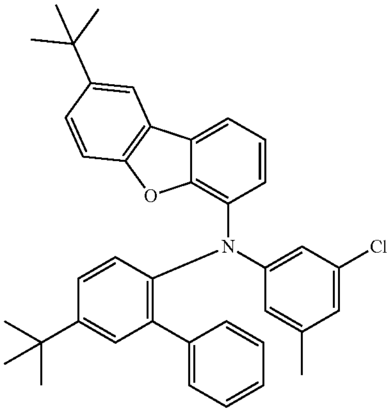

88

After 30 g of A2, 65.4 g of 8-(tert-butyl)-N-(5-(tert-butyl)-[1,1'-biphenyl]-2-yl)dibenzo[b,d]furan-4-amine, 28.1 g of sodium-tert-butoxide, and 0.8 g of bis(tri-tert-butylphosphine)palladium(0) were put into 500 ml of toluene under a nitrogen atmosphere, the resulting mixture was stirred under reflux for 2 hours. After the completion of the reaction, the resulting product was extracted, and then recrystallized to obtain 65 g of Intermediate 88. (yield 78%). MS[M+H]+=573

2) Synthesis of Intermediate 89

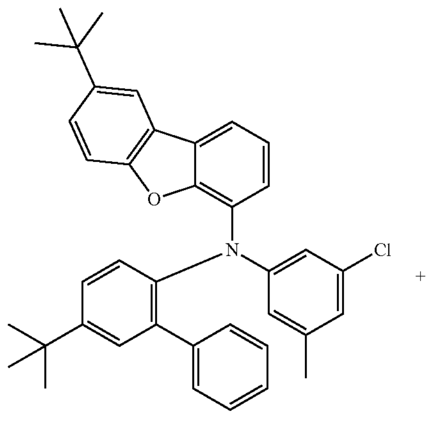

88

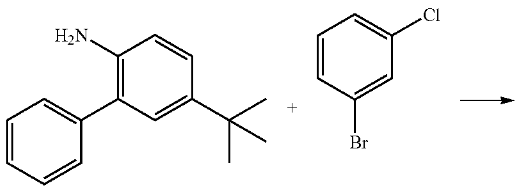

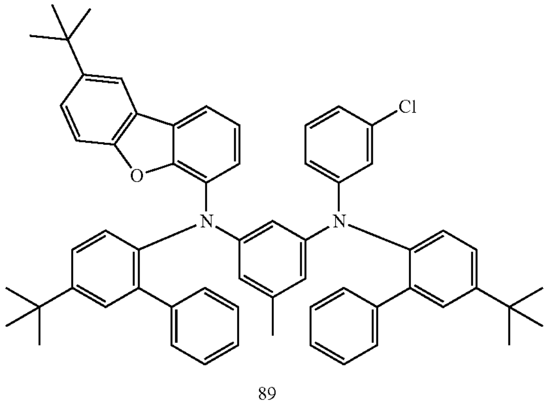

89

After 40 g of Intermediate 88, 15.8 g of 5-(tert-butyl)-[1, 1'-biphenyl]-2-amine, 0.4 g of bis(tri-tert-butylphosphine) palladium(0), and 17 g of sodium-tert-butoxide were put into 600 ml of toluene under a nitrogen atmosphere, the resulting mixture was stirred under reflux for 1 hour. Thereafter, whether the reaction proceeded was confirmed, and then 13.4 g of 1-bromo-3-chlorobenzene was put thereinto during the stirring, and then the resulting mixture was stirred under reflux for 4 hours. After the completion of the reaction, the resulting product was extracted, and then recrystallized to obtain 44 g of Intermediate 89. (yield 72%). MS[M+H]+=873

3) Synthesis of Intermediate 90

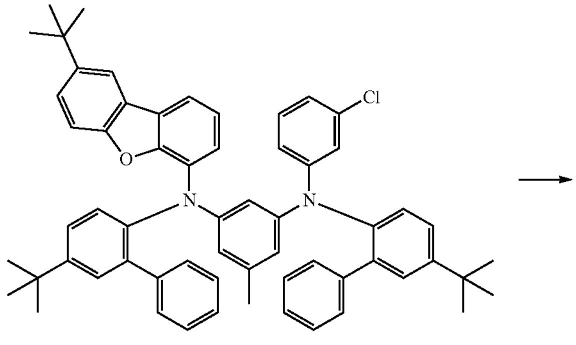

89

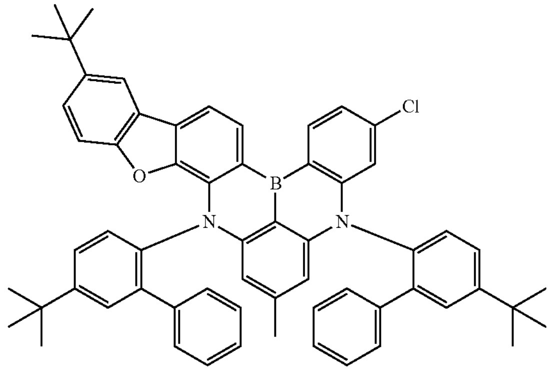

90

After 25 g of Intermediate 89 and 19.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 90 (yield 30%). MS[M+H]+=881

4) Synthesis of Compound 37

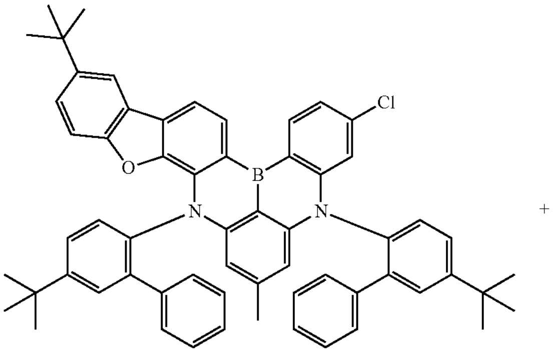

90

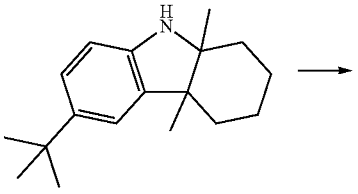

-continued

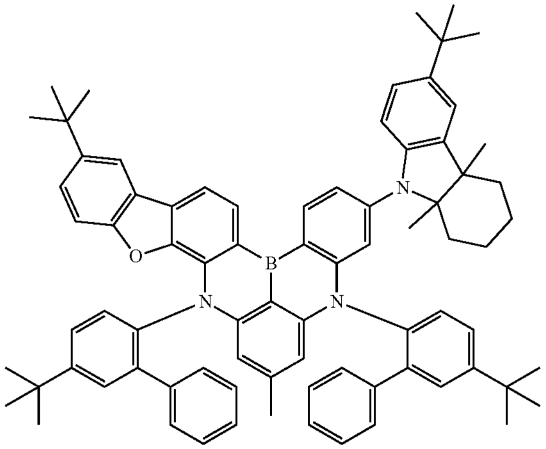

C-37

After 7 g of Intermediate 90, 2.1 g of 6-(tert-butyl)-4a,9a-dimethyl-2,3,4,4a,9,9a-hexahydro-1H-carbazole, 1.6 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.5 g of Compound 37 (C-37). (yield 74%). MS[M+H]+=1101

Synthesis Example 34. Synthesis of Compound 38

1) Synthesis of Intermediate 91

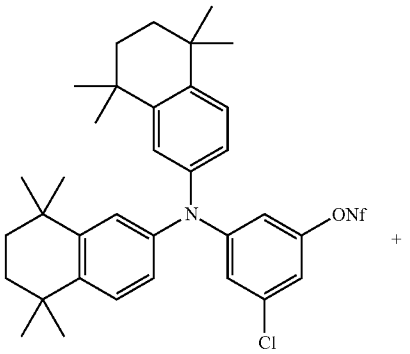

79

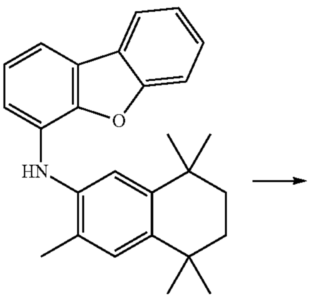

-continued

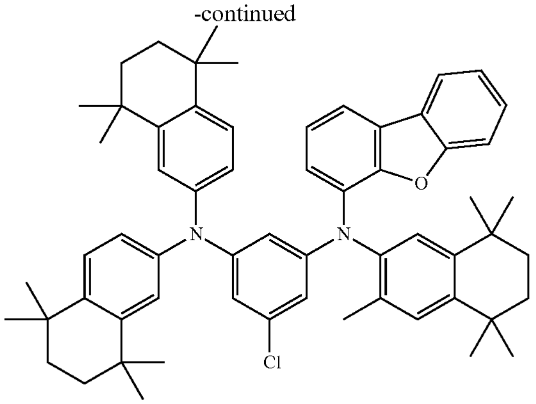

91

After 40 g of Intermediate 79, 19.2 g of N-(3,5,5,8,8-pentamethyl-5,6,7,8-tetrahydronaphthalen-2-yl)-dibenzo[b,d]furan-4-amine, 0.9 g of Pd(dba)2, 1.4 g of Xphos, and 49 g of cesium carbonate were put into 600 ml of xylene under a nitrogen atmosphere, the resulting mixture was stirred under reflux for 24 hours. After the completion of the reaction, the resulting product was extracted, and then recrystallized to obtain 33 g of Intermediate 91 (yield 75%). MS[M+H]+=883

2) Synthesis of Intermediate 92

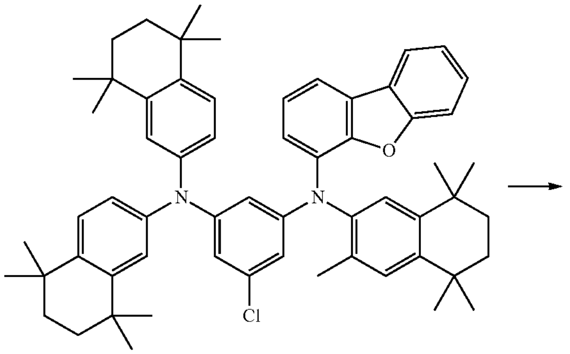

91

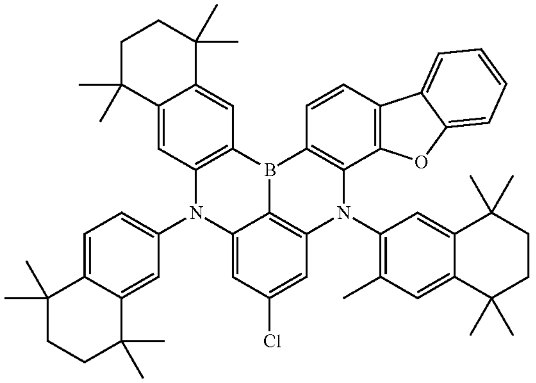

92

After 25 g of Intermediate 91 and 18.9 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.4 g of Intermediate 92 (yield 29%). MS[M+H]+=891

3) Synthesis of Compound 38

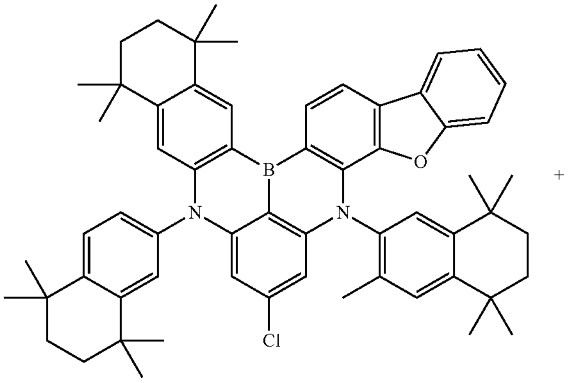

92

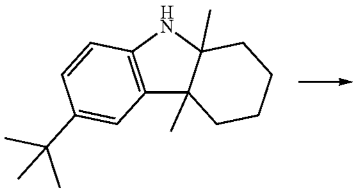

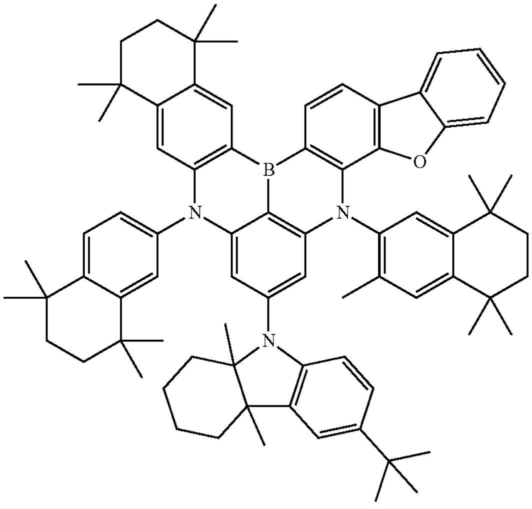

C-38

After 7 g of Intermediate 92, 2.1 g of 6-(tert-butyl)-4a, 9a-dimethyl-2,3,4,4a,9,9a-hexahydro-1H-carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 38 (C-38). (yield 75%). MS[M+H]+=1111

Synthesis Example 35. Synthesis of Compound 39

1) Synthesis of Intermediate 93

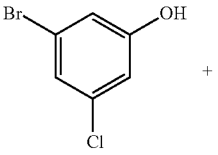

A4

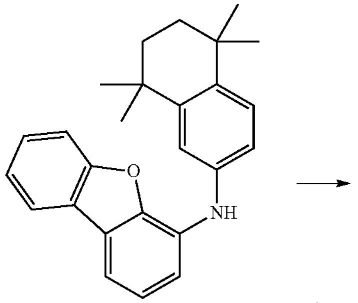

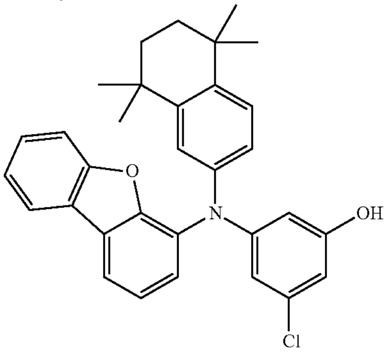

93

After 40 g of A4, 71.3 g of N-(5,5,8,8-tetramethyl-5,6,7,8-tetrahydronaphthalen-2-yl)dibenzo[b,d]furan-4-amine, 55.6 g of sodium-tert-butoxide, and 1 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 72 g of Intermediate 93. (yield 75%). MS[M+H]+=497

2) Synthesis of Intermediate 94

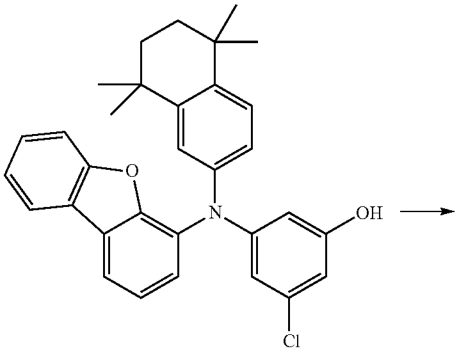

93

-continued

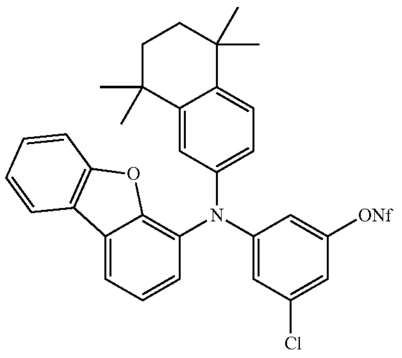

94

After 40 g of intermediate 93, 21.7 ml of 1,1,2,2,3,3,4,4,4-nonafluorobutane-1-sulfonyl fluoride, and 33.4 g of potassium carbonate were put into 400 ml of tetrahydrofuran and 200 ml of water, the resulting mixture was reacted for 3 hours, and then the resulting product was extracted after the completion of the reaction, and then the solution was removed to obtain 60 g of Intermediate 94. (yield 96%). MS[M+H]+=779

3) Synthesis of Intermediate 95

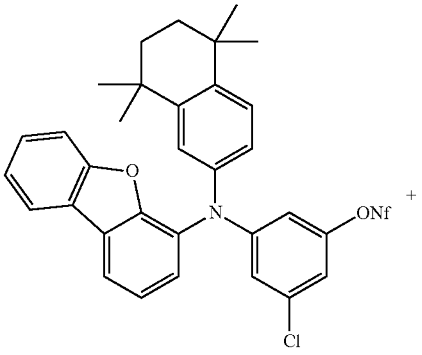

94

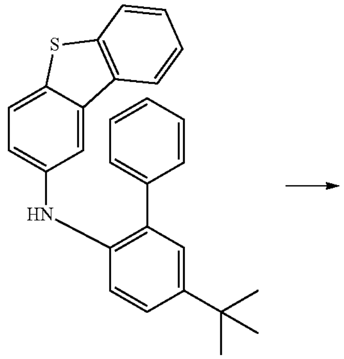

-continued

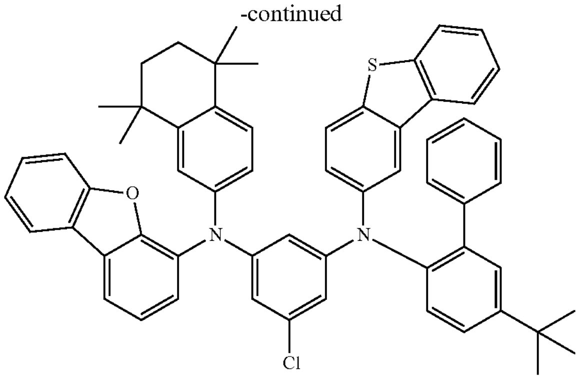

95

After 40 g of Intermediate 94, 21 g of N-(5-(tert-butyl)-[1,1'-biphenyl]-2-yl)dibenzo[b,d]thiophen-2-amine, 0.90 g of Pd(dba)2, 1.47 g of Xphos, and 50.3 g of cesium carbonate were put into 500 ml of xylene under a nitrogen atmosphere, the resulting mixture was stirred under reflux for 24 hours. After the completion of the reaction, the resulting product was extracted, and then recrystallized to obtain 34 g of Intermediate 95 (yield 75%). MS[M+H]+=887

4) Synthesis of Intermediate 96

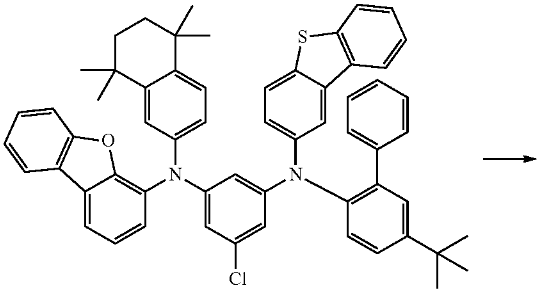

95

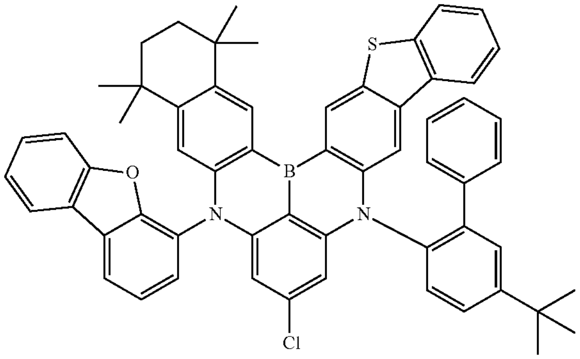

96

After 25 g of Intermediate 95 and 18.8 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.5 g of Intermediate 96 (yield 30%). MS[M+H]+=895

5) Synthesis of Compound 39

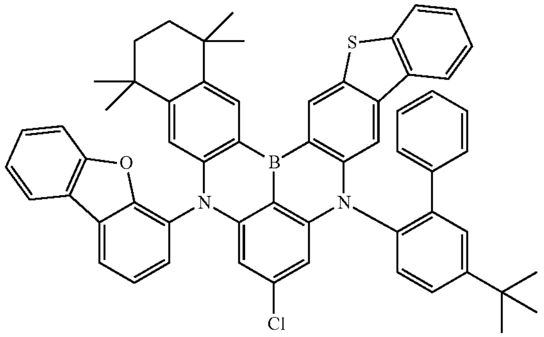

96

+

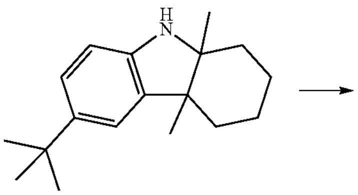

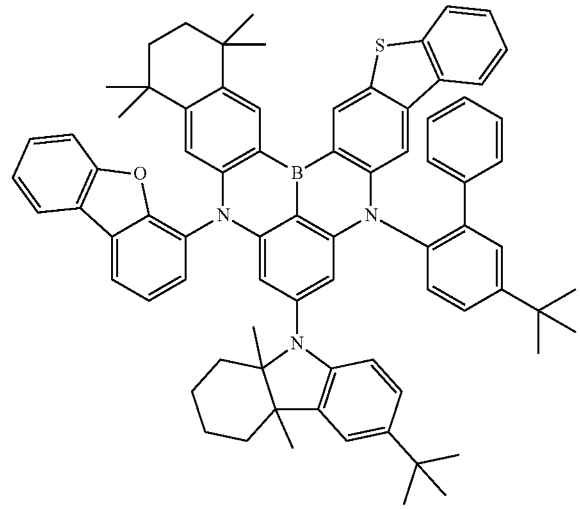

C-39

After 7 g of Intermediate 96, 2.1 g of 6-(tert-butyl)-4a, 9a-dimethyl-2,3,4,4a,9,9a-hexahydro-1H-carbazole, 1.5 g of sodium-tert-butoxide, and 0.04 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain 6.6 g of Compound 39 (C-39). (yield 76%). MS[M+H]+=1115

EXPERIMENTAL EXAMPLE 1

Example 1

A glass substrate thinly coated with indium tin oxide (ITO) to have a thickness of 1,400 Å was put into distilled water in which a detergent was dissolved, and ultrasonically washed. In this case, a product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted by using isopropyl alcohol, acetone, and methanol solvents, and the resulting product was dried and then transported to a plasma washing machine. Furthermore, the substrate was cleaned by using oxygen plasma for 5 minutes, and then was transported to a vacuum deposition machine.

The following HI-A and HAT were thermally vacuum deposited to have a thickness of 650 Å and 50 Å, respectively, on the ITO transparent electrode prepared as described, thereby forming first and second hole injection layers. The following HT-A was vacuum deposited to have a thickness of 600 Å on the hole injection layer, thereby forming a hole transport layer.

The following HT-B was vacuum deposited to have a thickness of 50 Å on the hole transport layer, thereby forming an electron blocking layer. Subsequently, 2 parts by weight of Compound 1 (C-1) of the present invention as a blue light emitting dopant based on 100 parts by weight of the light emitting layer and the following BH as a host were vacuum deposited to have a thickness of 200 Å on the electron blocking layer, thereby forming a light emitting layer. Next, the following compound ET-A as a first electron transport layer was vacuum deposited to have a thickness of 50 Å on the light emitting layer, and subsequently, the following ET-B and LiQ were vacuum deposited at a weight ratio of 1:1, thereby forming a second electron transport layer having a thickness of 360 Å. LiQ was vacuum deposited on the second electron transport layer, thereby forming an electron injection layer having a thickness of 5 Å. Aluminum and silver were deposited at a weight ratio of 10:1 to have a thickness of 220 Å on the electron injection layer, aluminum was deposited to have a thickness of 1,000 Å thereon, thereby forming a negative electrode.

In the aforementioned procedure, the deposition rate of the organic materials were maintained at 0.4 to 0.9 Å/sec, the deposition rate of aluminum of the negative electrode was maintained at 2 Å/sec, and the degree of vacuum during the deposition was maintained at $1\times10^{-7}$ to $1\times10^{-8}$ torr, thereby manufacturing an organic light emitting device.

HI-A
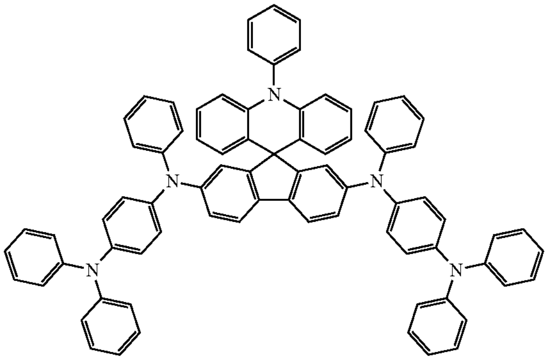
HAT
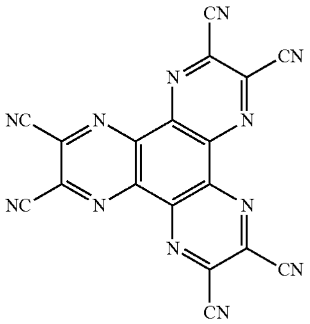
HT-A
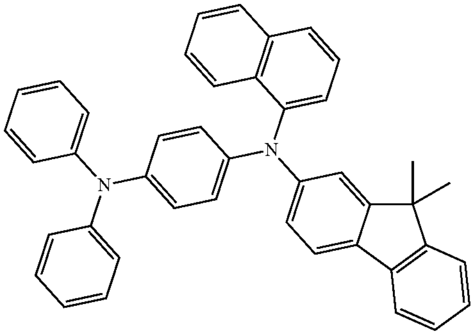
HT-B
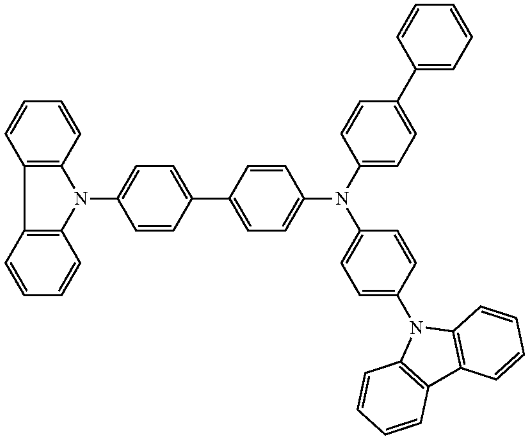
BH
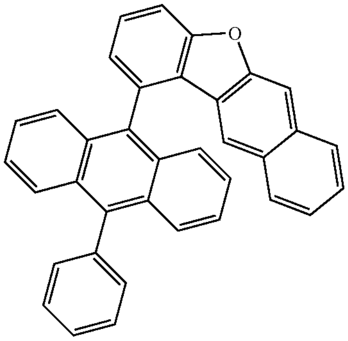
1 (C-1)
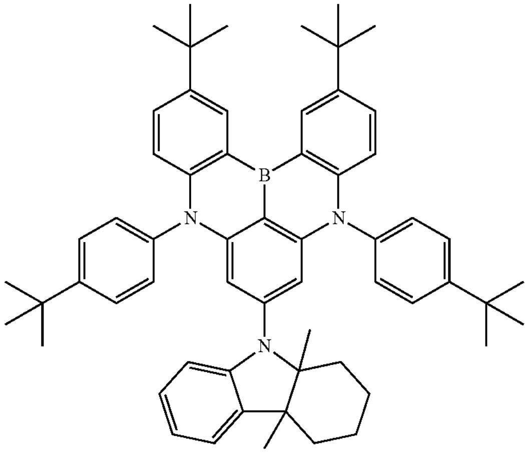

-continued

ET-A

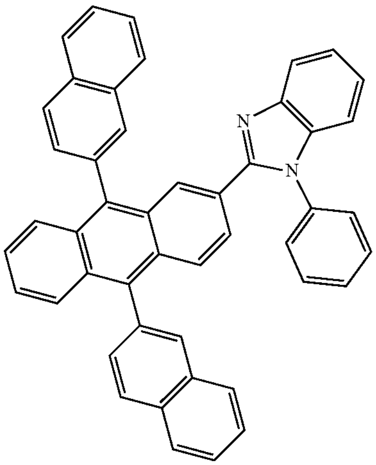

ET-B

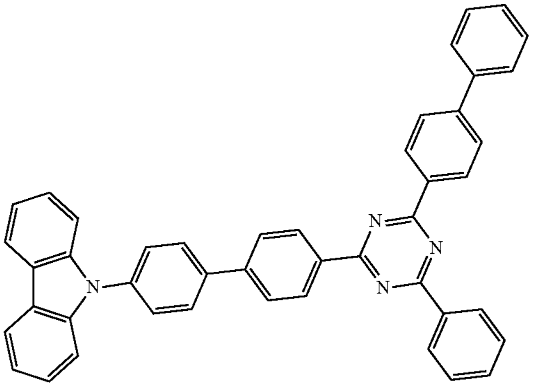

LiQ

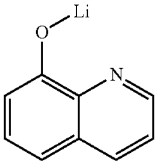

Examples 2 to 35 and Comparative Example 1

Organic light emitting devices of Examples 2 to 35 and Comparative Example 1 were manufactured in the same manner as in Example 1, except that compounds described in the following Table 1 were used as dopants of the light emitting layer instead of Compound 1 in Example 1.

[Comparative Compound 1]

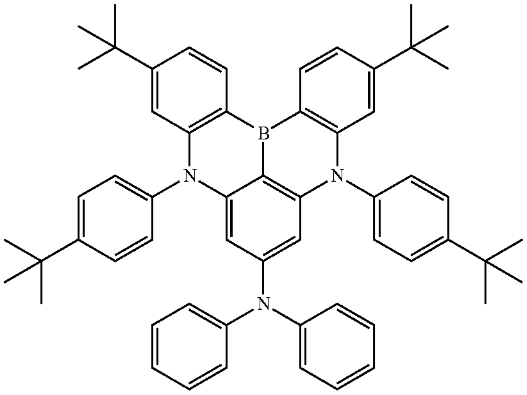 [SMILES: CC(C)(C)c1ccc(N2c3cc(C(C)(C)C)ccc3B3c4ccc(C(C)(C)C)cc4N(c4ccc(C(C)(C)C)cc4)c4cc(N(c5ccccc5)c5ccccc5)cc2c43)cc1]

Efficiencies when a current density of 10 $mA/cm^2$ was applied to the organic light emitting devices in Examples 1 to 35 and Comparative Example 1 and service lives (LT95) when a current density of 20 $mA/cm^2$ was applied to the devices were measured, and the results are shown in the following Table 1. In this case, LT95 means time taken for the luminance to decrease to 95% when the initial luminance at the current density of 20 $mA/cm^2$ is set to 100%.

TABLE 1

| | | 10 $mA/cm^2$ | | | 20 $mA/cm^2$ |
|---|---|---|---|---|---|
| | Dopant | Efficiency (cd/A) | Color coordinate CIEx | Color coordinate CIEy | LT95 (hr) |
| Example 1 | Compound 1 | 8.4 | 0.15 | 0.05 | 240 |
| Example 2 | Compound 2 | 9.1 | 0.15 | 0.05 | 242 |
| Example 3 | Compound 3 | 9.1 | 0.15 | 0.05 | 245 |
| Example 4 | Compound 4 | 8.75 | 0.16 | 0.04 | 241 |
| Example 5 | Compound 5 | 8.82 | 0.15 | 0.05 | 242 |
| Example 6 | Compound 6 | 8.52 | 0.16 | 0.06 | 245 |
| Example 7 | Compound 7 | 8.43 | 0.15 | 0.06 | 243 |
| Example 8 | Compound 8 | 8.77 | 0.15 | 0.05 | 244 |
| Example 9 | Compound 9 | 8.5 | 0.15 | 0.05 | 245 |
| Example 10 | Compound 10 | 8.6 | 0.15 | 0.05 | 243 |
| Example 11 | Compound 11 | 8.51 | 0.16 | 0.04 | 243 |
| Example 12 | Compound 12 | 8.53 | 0.16 | 0.05 | 246 |
| Example 13 | Compound 13 | 8.75 | 0.15 | 0.05 | 245 |
| Example 14 | Compound 14 | 8.43 | 0.15 | 0.05 | 245 |
| Example 15 | Compound 15 | 8.45 | 0.15 | 0.06 | 243 |
| Example 16 | Compound 16 | 8.45 | 0.16 | 0.05 | 245 |
| Example 17 | Compound 17 | 8.75 | 0.15 | 0.04 | 260 |
| Example 18 | Compound 22 | 9.1 | 0.16 | 0.06 | 241 |
| Example 19 | Compound 23 | 9 | 0.16 | 0.06 | 243 |
| Example 20 | Compound 24 | 9.05 | 0.16 | 0.05 | 245 |
| Example 21 | Compound 25 | 9.07 | 0.16 | 0.05 | 244 |
| Example 22 | Compound 26 | 9.11 | 0.17 | 0.07 | 242 |
| Example 23 | Compound 27 | 8.94 | 0.16 | 0.08 | 241 |
| Example 24 | Compound 28 | 8.96 | 0.16 | 0.07 | 240 |
| Example 25 | Compound 29 | 9.03 | 0.16 | 0.07 | 247 |
| Example 26 | Compound 30 | 9.13 | 0.15 | 0.05 | 245 |
| Example 27 | Compound 31 | 8.55 | 0.15 | 0.06 | 243 |
| Example 28 | Compound 32 | 8.67 | 0.15 | 0.06 | 245 |
| Example 29 | Compound 33 | 8.85 | 0.15 | 0.05 | 240 |
| Example 30 | Compound 34 | 8.84 | 0.15 | 0.05 | 244 |
| Example 31 | Compound 35 | 8.89 | 0.15 | 0.05 | 241 |
| Example 32 | Compound 36 | 8.9 | 0.15 | 0.06 | 245 |
| Example 33 | Compound 37 | 8.74 | 0.16 | 0.07 | 247 |
| Example 34 | Compound 38 | 8.73 | 0.15 | 0.07 | 241 |
| Example 35 | Compound 39 | 8.72 | 0.16 | 0.07 | 244 |
| Comparative Example 1 | Comparative Compound 1 | 7.11 | 0.15 | 0.06 | 198 |

EXPERIMENTAL EXAMPLE 2

Examples 1-1 to 1-4

Organic light emitting devices of Examples 1-1 to 1-4 were manufactured in the same manner as in Example 1, except that the content of the dopant of the light emitting layer in Example 1 was changed as in the following Table 2.

Examples 2-1 to 2-4

Organic light emitting devices of Examples 2-1 to 2-4 were manufactured in the same manner as in Example 2, except that the content of the dopant of the light emitting layer in Example 2 was changed as in the following Table 2.

Examples 14-1 to 14-4

Organic light emitting devices of Examples 14-1 to 14-4 were manufactured in the same manner as in Example 14, except that the content of the dopant of the light emitting layer in Example 14 was changed as in the following Table 2.

Examples 29-1 to 29-4

Organic light emitting devices of Examples 29-1 to 29-4 were manufactured in the same manner as in Example 29, except that the content of the dopant of the light emitting layer in Example 29 was changed as in the following Table 2.

Examples 34-1 to 34-4

Organic light emitting devices of Examples 34-1 to 34-4 were manufactured in the same manner as in Example 34, except that the content of the dopant of the light emitting layer in Example 34 was changed as in the following Table 2.

Comparative Examples 1-1 to 1-4

Organic light emitting devices of Examples 1-1 to 1-4 were manufactured in the same manner as in Comparative Example 1, except that the content of the dopant of the light emitting layer in Comparative Example 1 was changed as in the following Table 2.

TABLE 2

| | | 10 mA/cm$^2$ | | 20 |
|---|---|---|---|---|
| | Dopant content | Color coordinate CIEy | Efficiency (cd/A) | mA/cm$^2$ LT95 (hr) |
| Example 1-1 | 1 wt % | 0.05 | 8.33 | 238 |
| Example 1 | 2 wt % | 0.05 | 8.4 | 240 |
| Example 1-2 | 3 wt % | 0.05 | 8.84 | 243 |
| Example 1-3 | 4 wt % | 0.05 | 9.18 | 250 |
| Example 1-4 | 5 wt % | 0.06 | 9.38 | 266 |
| Example 2-1 | 1 wt % | 0.05 | 8.9 | 242 |
| Example 2 | 2 wt % | 0.05 | 9.1 | 242 |
| Example 2-2 | 3 wt % | 0.05 | 9.26 | 250 |
| Example 2-3 | 4 wt % | 0.06 | 9.48 | 259 |
| Example 2-4 | 5 wt % | 0.06 | 9.92 | 271 |
| Example 14-1 | 1 wt % | 0.05 | 8.41 | 244 |
| Example 14 | 2 wt % | 0.05 | 8.43 | 245 |
| Example 14-2 | 3 wt % | 0.05 | 8.57 | 251 |
| Example 14-3 | 4 wt % | 0.05 | 8.93 | 256 |
| Example 14-4 | 5 wt % | 0.06 | 9.23 | 265 |
| Example 29-1 | 1 wt % | 0.06 | 8.95 | 244 |
| Example 29 | 2 wt % | 0.07 | 9.03 | 247 |
| Example 29-2 | 3 wt % | 0.07 | 9.31 | 258 |
| Example 29-3 | 4 wt % | 0.07 | 9.55 | 263 |
| Example 29-4 | 5 wt % | 0.08 | 9.77 | 269 |
| Example 34-1 | 1 wt % | 0.07 | 8.71 | 240 |
| Example 34 | 2 wt % | 0.07 | 8.73 | 241 |
| Example 34-2 | 3 wt % | 0.07 | 8.85 | 245 |
| Example 34-3 | 4 wt % | 0.07 | 8.91 | 255 |
| Example 34-4 | 5 wt % | 0.07 | 9.02 | 256 |
| Comparative Example 1-1 | 1 wt % | 0.06 | 7.05 | 197 |
| Comparative Example 1 | 2 wt % | 0.06 | 7.11 | 198 |
| Comparative Example 1-2 | 3 wt % | 0.08 | 7.03 | 190 |
| Comparative Example 1-3 | 4 wt % | 0.09 | 6.81 | 181 |
| Comparative Example 1-4 | 5 wt % | 0.1 | 6.22 | 170 |

From the experimental results of Table 1, it can be confirmed that when the compound of the present invention is used as a material for an organic light emitting device, the efficiency and service life of the device are better than those of the device of Comparative Example 1 in which Comparative Example 1 is used.

Furthermore, from the experimental results of Table 2, it can be confirmed that when the content of the compound of the present invention included in the light emitting layer is increased, efficiency and service life are increased while maintaining the color coordinate.

The invention claimed is:

1. A compound represented by any one of the following Formulae 1-1 and 1-2:

[Formula 1-1]

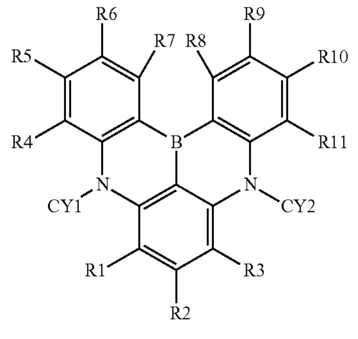

in Formula 1-1,

CY1 and CY2 are the same as or different from each other, and are each independently a substituted or unsubstituted hydrocarbon ring group; or a substituted or unsubstituted heterocyclic group, R1 to R3 are the same as or different from each other, and are each independently hydrogen; deuterium; a halogen group; a nitrile group; a substituted or unsubstituted silyl group;

a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, R4 to R11 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, or are bonded to an adjacent group to form a substituted or unsubstituted ring, one or more from the group of a substituent group of a ring formed by bonding adjacent groups of R4 to R11, a group which does not form a ring among R4 to R11, and R1 to R3 is or are the group represented by Formula 2,

[Formula 1-2]

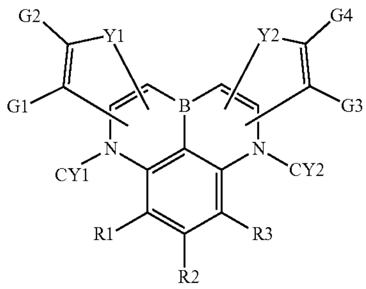

in Formula 1-2,

CY1 and CY2 are the same as or different from each other, and are each independently a substituted or unsubstituted hydrocarbon ring group; or a substituted or unsubstituted heterocyclic group, R1 to R3 are the same as or different from each other, and are each independently hydrogen; deuterium; a halogen group; a nitrile group; a substituted or unsubstituted silyl group;

a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, Y1 and Y2 are the same as or different from each other, and are each independently O; S; or CRaRb, Ra and Rb are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, G1 and G2 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, or are bonded to each other to form a substituted or unsubstituted ring, G3 and G4 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, or are bonded to each other to form a substituted or unsubstituted ring, and one or more from the group of a substituent group of a ring formed by bonding G1 and G2 to each other, a substituent group of a ring formed by bonding G3 and G4 to each other, a group which does not form a ring among G1 to G4, and R1 to R3 is or are the group represented by Formula 2,

[Formula 2]

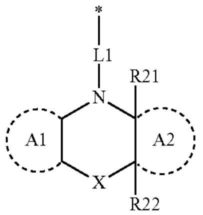

in Formula 2,

A1 is a substituted or unsubstituted aromatic hydrocarbon ring,

A2 is a substituted or unsubstituted alicyclic hydrocarbon ring,

X is a direct bond; or —CRR'—,

R, R', R21, and R22 are the same as or different from each other, and are each independently hydrogen; deuterium; a halogen group; a nitrile group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; or a substituted or unsubstituted heterocyclic group, L1 is a direct bond; a substituted or unsubstituted alkylene group; a substituted or unsubstituted arylene group; or a substituted or unsubstituted heteroarylene group, and is a position bonded to Formula 1-1 or Formula 1-2.

2. The compound of claim 1, wherein the compound of Formula 1-1 is represented by any one of the following Formulae 1-1-1 to 1-1-9:

[Formula 1-1-1]

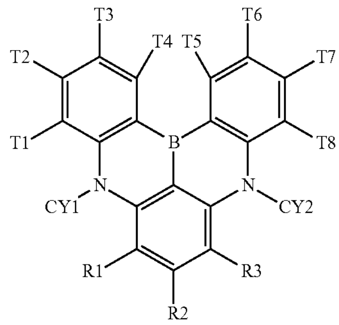

in Formula 1-1-1, definitions of CY1 and CY2 are the same as those in Formula 1, R1 to R3 and T1 to T8 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, and one or more of R1 to R3 and T1 to T8 is or are the group represented by Formula 2,

[Formula 1-1-2]

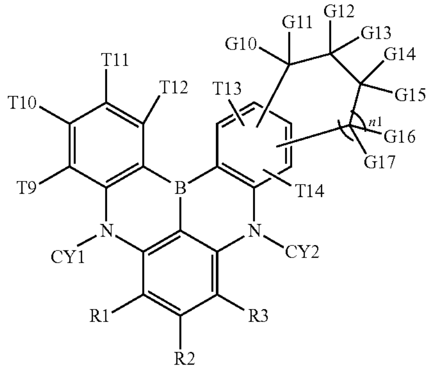

in Formula 1-1-2, definitions of CY1 and CY2 are the same as those in Formula 1, R1 to R3, T9 to T14, and G10 to G17 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n1 is 0 or 1, one or more of R1 to R3, T9 to T14, and G10 to G17 is or are the group represented by Formula 2,

[Formula 1-1-3]

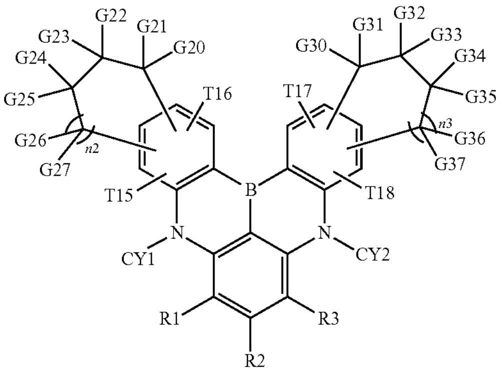

in Formula 1-1-3, definitions of CY1 and CY2 are the same as those in Formula 1, R1 to R3, T15 to T18, G20 to G27, and G30 to G37 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n2 and n3 are each 0 or 1, one or more of R1 to R3, T15 to T18, G20 to G27, and G30 to G37 is or are the group represented by Formula 2,

[Formula 1-1-4]

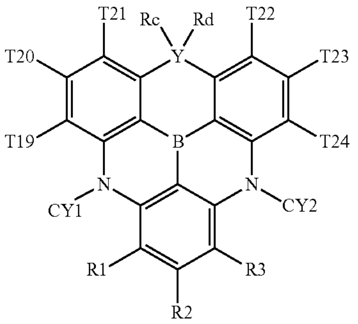

in Formula 1-1-4, definitions of CY1 and CY2 are the same as those in Formula 1, Y is Si or C, R1 to R3 and T19 to T24 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, Rc and Rd are the same as or different from each other, and are each independently hydrogen; deuterium; a halogen group; a nitrile group; a substituted or unsubstituted silyl group;

a substituted or unsubstituted boron group; a substituted or unsubstituted alkyl group; a substituted or unsubstituted cycloalkyl group; a substituted or unsubstituted aryl group; or a substituted or unsubstituted heterocyclic group, and one or more of R1 to R3 and T19 to T24 is or are the group represented by Formula 2,

[Formula 1-1-5]

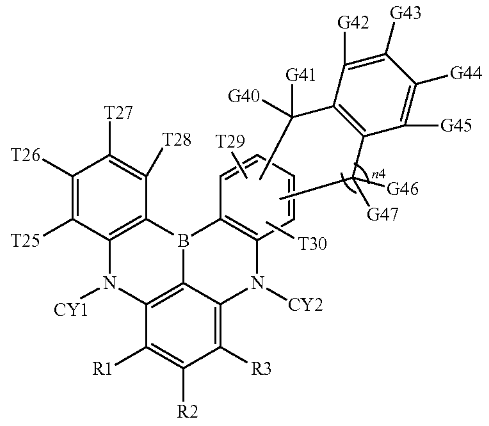

in Formula 1-1-5, definitions of CY1 and CY2 are the same as those in Formula 1, R1 to R3, T25 to T30, and G40 to G47 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n4 is 0 or 1, one or more of R1 to R3, T25 to T30, and G40 to G47 is or are the group represented by Formula 2,

[Formula 1-1-6]

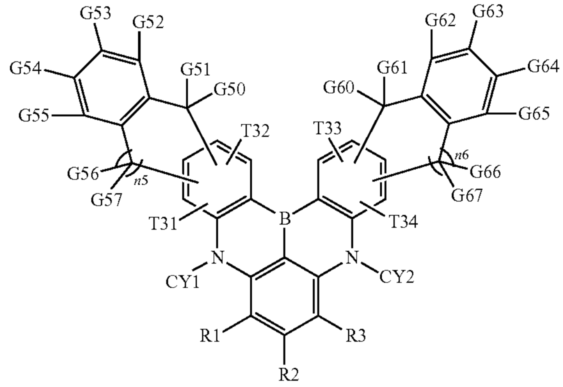

in Formula 1-1-6, definitions of CY1 and CY2 are the same as those in Formula 1, R1 to R3, T31 to T34, G50 to G57, and G60 to G67 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n5 and n6 are each 0 or 1, and one or more of R1 to R3, T31 to T34, G50 to G57, and G60 to G67 is or are the group represented by Formula 2,

[Formula 1-1-7]

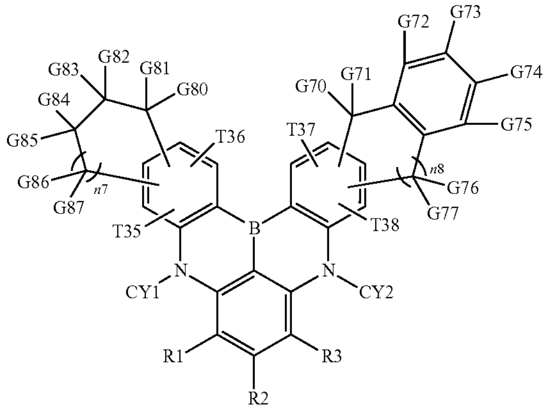

in Formula 1-1-7, definitions of CY1 and CY2 are the same as those in Formula 1, R1 to R3, T35 to T38, G70 to G77, and G80 to G87 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n7 and n8 are each 0 or 1, one or more of R1 to R3, T35 to T38, G70 to G77, and G80 to G87 is or are the group represented by Formula 2,

[Formula 1-1-8]

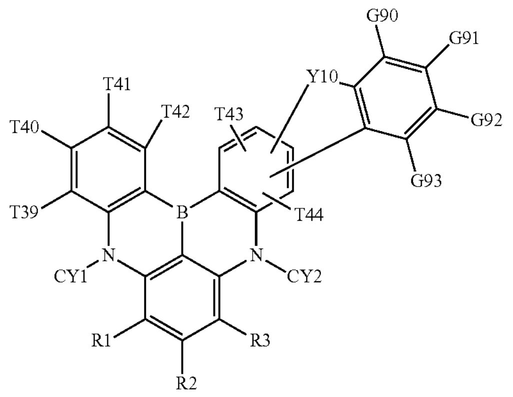

in Formula 1-1-8, definitions of CY1 and CY2 are the same as those in Formula 1, Y10 is O, S, or CReRf, Re and Rf are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3, T39 to T44, and G90 to G93 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, and one or more of R1 to R3, T39 to T44, and G90 to G93 is or are the group represented by Formula 2,

[Formula 1-1-9]

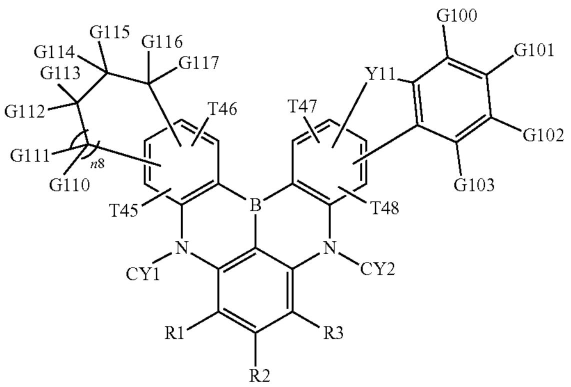

in Formula 1-1-9, definitions of CY1 and CY2 are the same as those in Formula 1, Y11 is O, S, or CRgRh, Rg and Rh are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3, T45 to T48, G100 to G103, and G110 to G117 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, n8 is 0 or 1, and one or more of R1 to R3, T45 to T48, G100 to G103, and G110 to G117 is or are the group represented by Formula 2.

3. The compound of claim 1, wherein the compound of Formula 1-2 is represented by any one of the following Formulae 1-2-1 and 1-2-2:

[Formula 1-2-1]

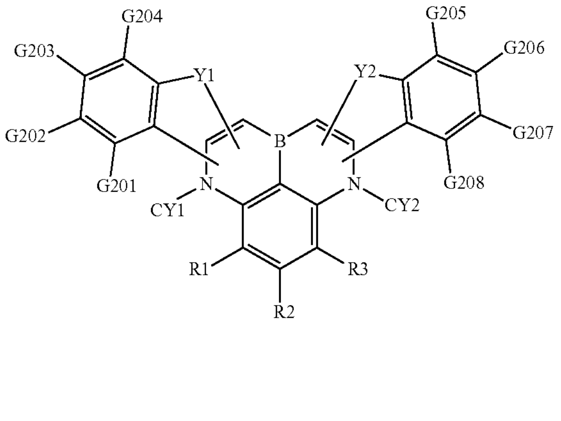

in Formula 1-2-1, definitions of CY1 and CY2 are the same as those in Formula 1, Y1 and Y2 are the same as or different from each other, and are each independently O; S; or CRaRb, and Rb are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3 and G201 to G208 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, one or more of R1 to R3 and G201 to G208 is or are the group represented by Formula 2,

[Formula 1-2-2]

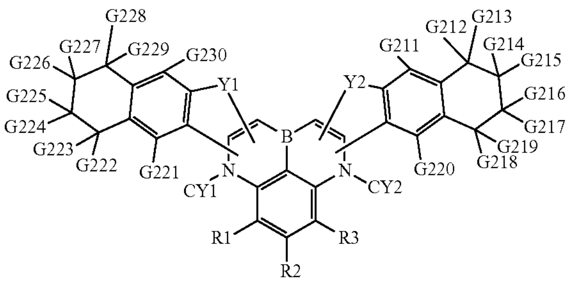

in Formula 1-2-2, definitions of CY1 and CY2 are the same as those in Formula 1, Y1 and Y2 are the same as or different from each other, and are each independently O; S; or CRaRb, Ra and Rb are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted cycloalkyl group; a substituted or unsubstituted aryl group; or a substituted or unsubstituted heterocyclic group, R1 to R3 and G211 to G230 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted aryl group; a substituted or unsubstituted heterocyclic group; or the group represented by Formula 2, and one or more of R1 to R3 and G211 to G230 is or are the group represented by Formula 2.

4. The compound of claim 1, wherein A1 is a substituted or unsubstituted benzene; a substituted or unsubstituted naphthalene; a substituted or unsubstituted anthracene; a substituted or unsubstituted phenanthrene; or a substituted or unsubstituted pyrene.

5. The compound of claim 1, wherein A2 is a substituted or unsubstituted cyclobutane; a substituted or unsubstituted cyclopentane; a substituted or unsubstituted cyclohexane; a substituted or unsubstituted cycloheptane; a substituted or unsubstituted cyclooctane; a substituted or unsubstituted decahydronaphthalene; a substituted or unsubstituted tetradecahydrophenanthrene; or tetrahydronaphthalene.

6. The compound of claim 1, wherein the group of Formula 2 is represented by any one of the following Formulae 2-1 to 2-11:

[Formula 2-1]

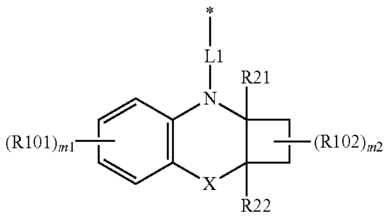

[Formula 2-2]

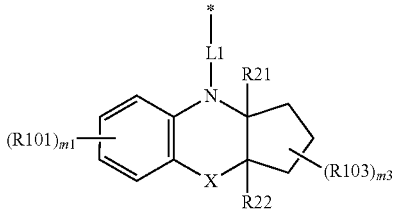

[Formula 2-3]

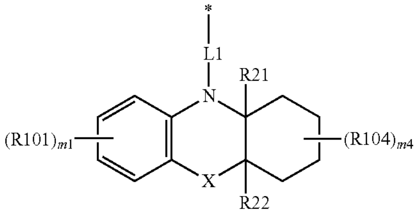

[Formula 2-4]

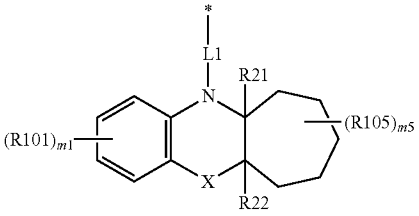

[Formula 2-5]

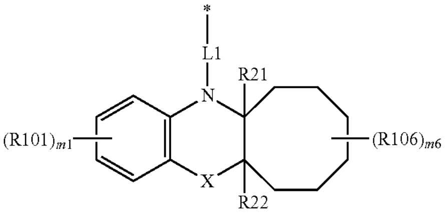

-continued

[Formula 2-6]

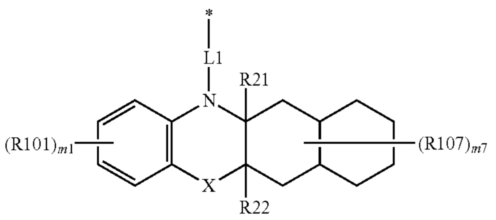

[Formula 2-7]

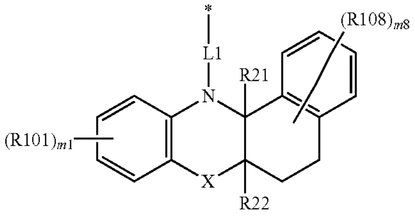

[Formula 2-8]

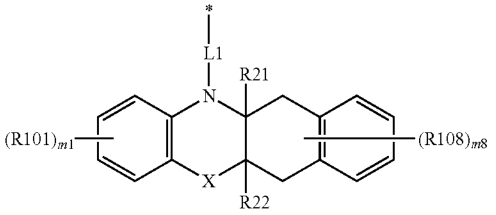

[Formula 2-9]

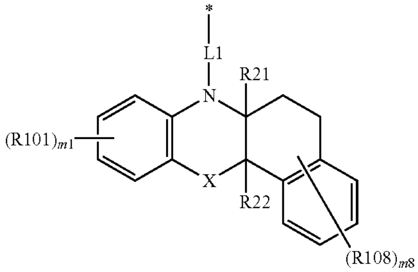

[Formula 2-10]

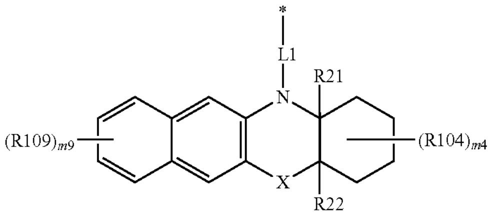

[Formula 2-11]

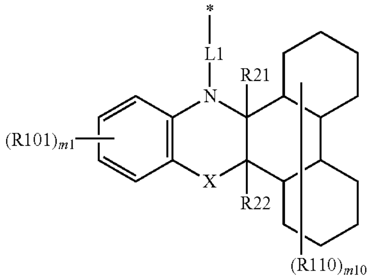

in Formulae 2-1 to 2-11, definitions of L1, X, R21, and R22 are the same as those defined in Formula 2, R101 to R110 are the same as or different from each other, and are each independently hydrogen; deuterium; a halogen group; a nitrile group; a substituted or unsubstituted silyl group; a substituted or unsubstituted boron group; a substituted or unsubstituted alkyl group; a substituted or unsubstituted alkenyl group; a substituted or unsubstituted alkynyl group; a substituted or unsubstituted alkoxy group; a substituted or unsubstituted aryloxy group; a substituted or unsubstituted cycloalkyl group; a substituted or unsubstituted amine group; a substituted or unsubstituted aryl group; or a substituted or unsubstituted heterocyclic group, m1 and m2 are each an integer from 0 to 4, m3 and m9 are each an integer from 0 to 6, m4 and m8 are each an integer from 0 to 8, m5 is an integer from 0 to 10, m6 is an integer from 0 to 12, m7 is an integer from 0 to 14, and m10 is an integer from 0 to 20, and when m1 to m10 are each 2 or higher, two or more substituents in the parenthesis are the same as or different from each other.

7. A compound represented by any one of the following compounds:

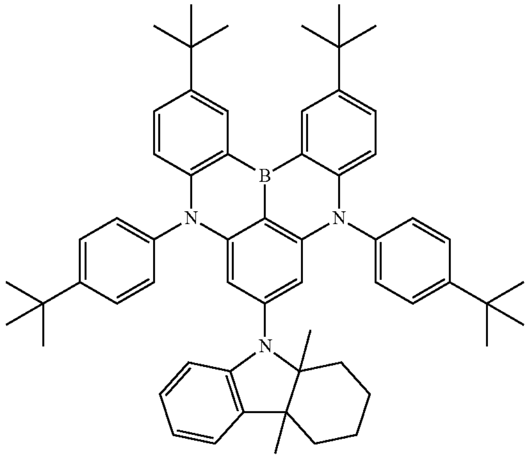

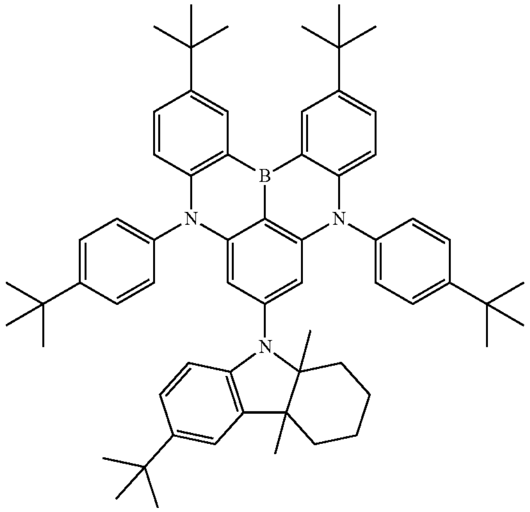

-continued
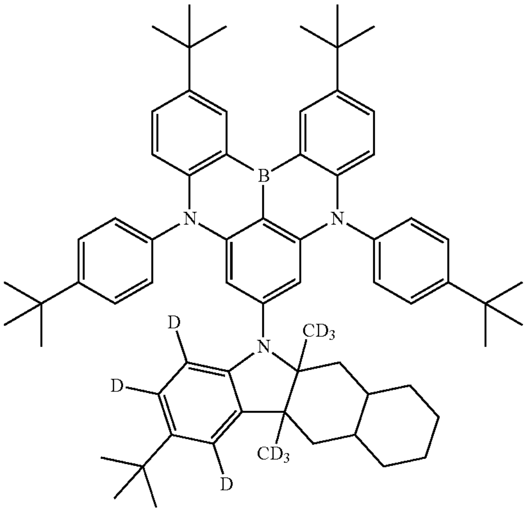
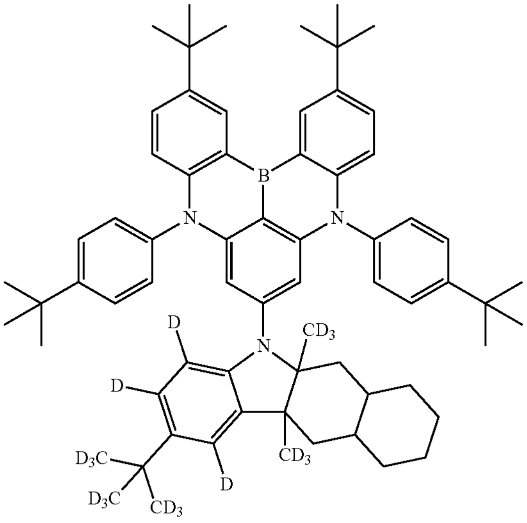
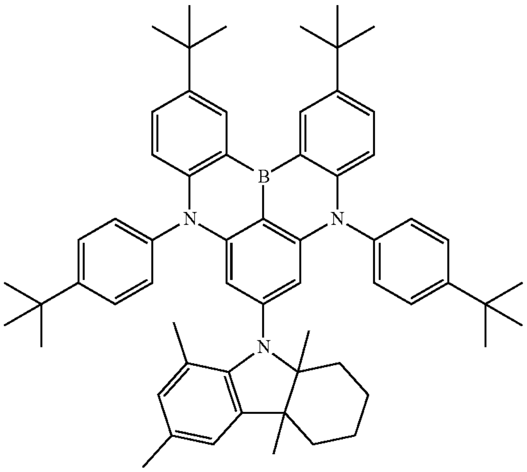
-continued
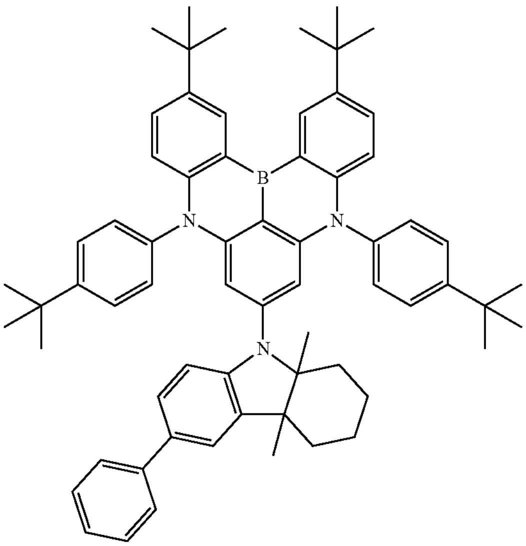
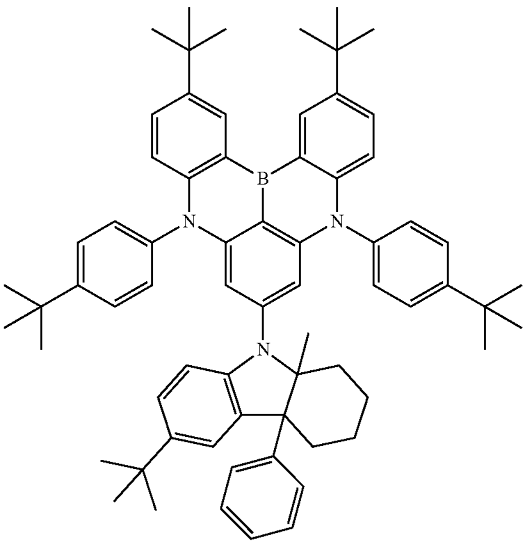
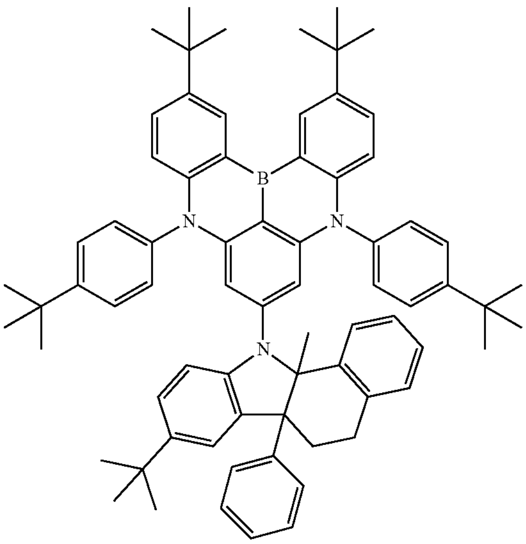

-continued
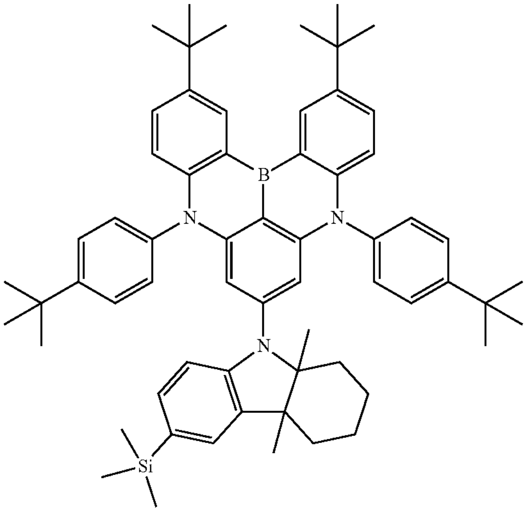
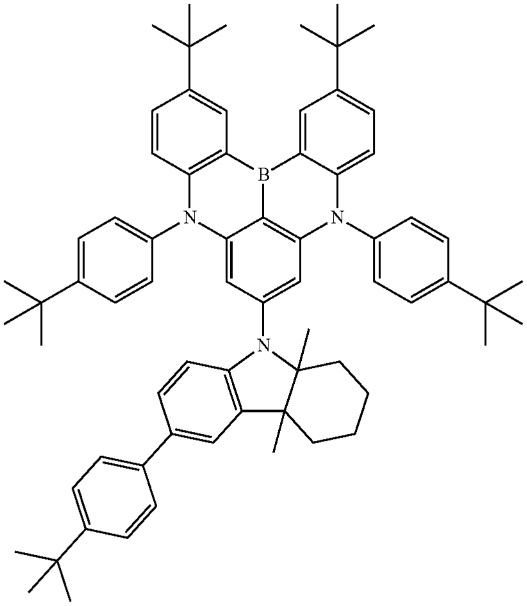
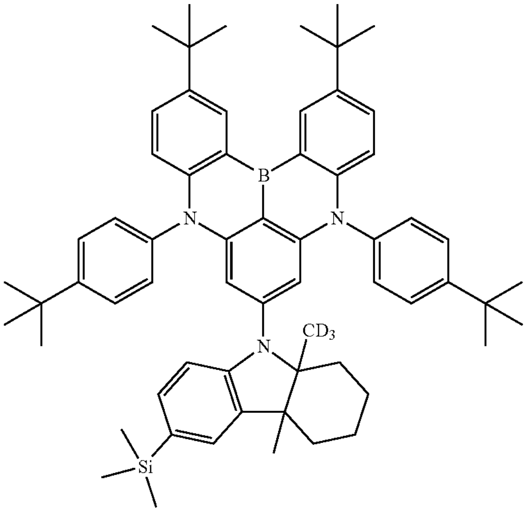
-continued
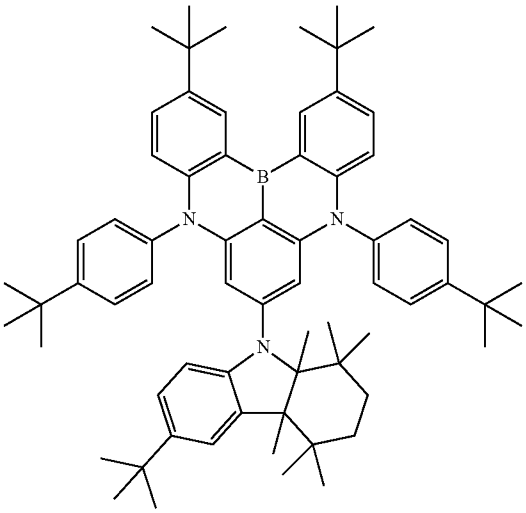
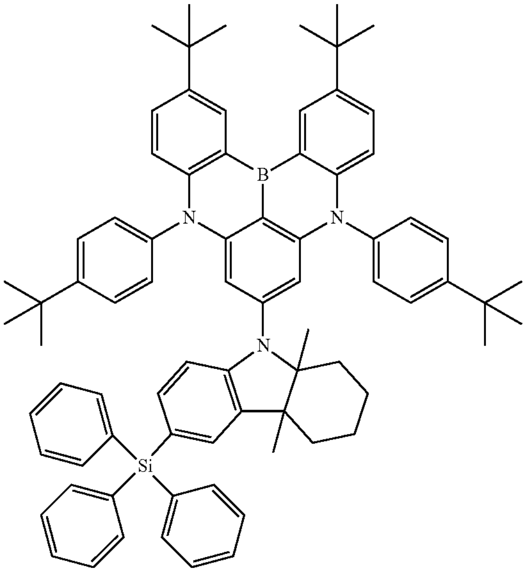
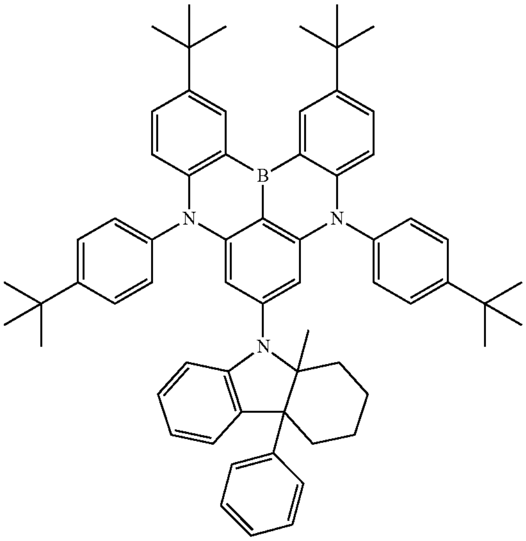

-continued
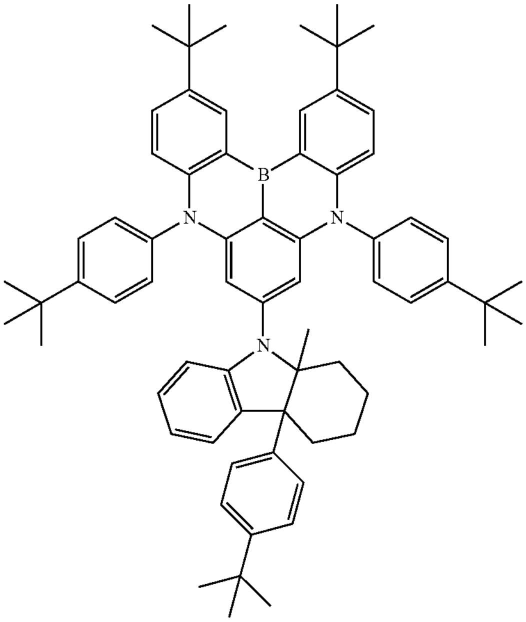
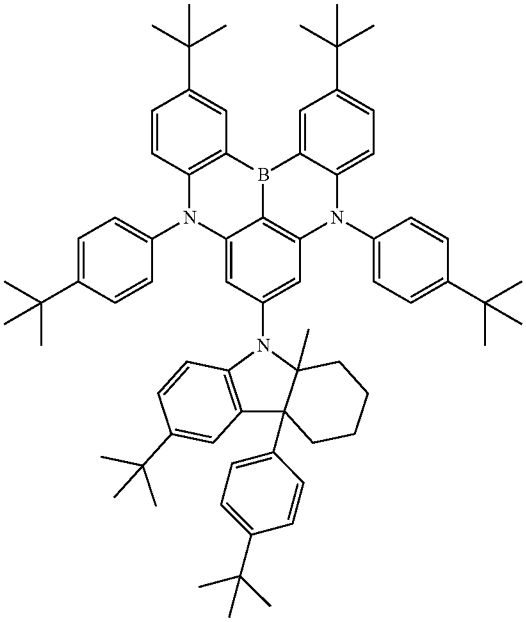
-continued
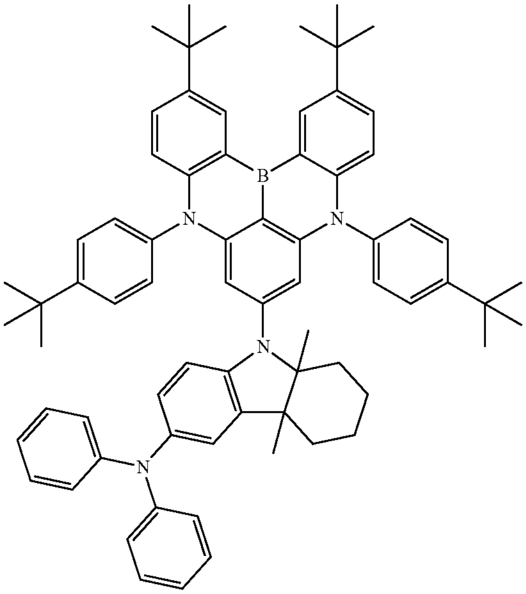
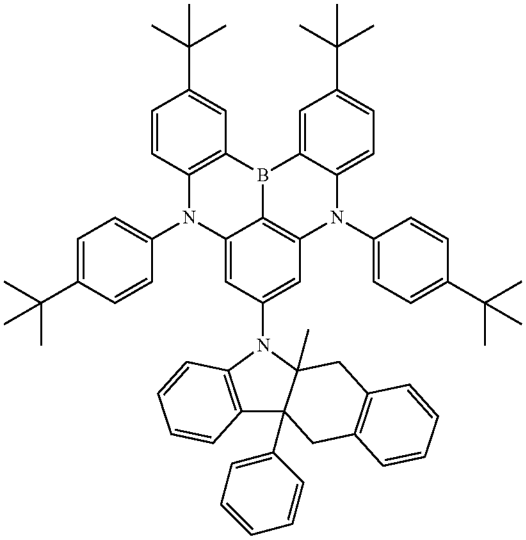
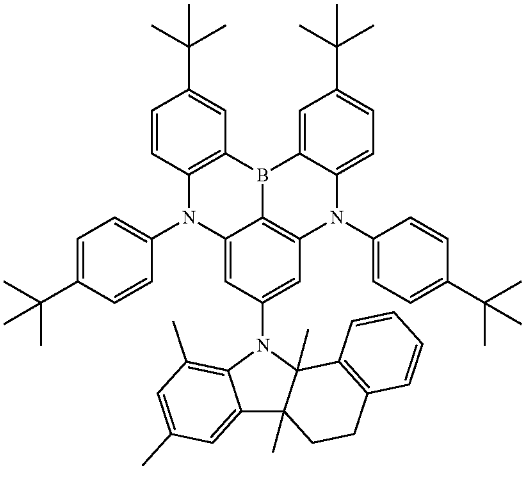

-continued
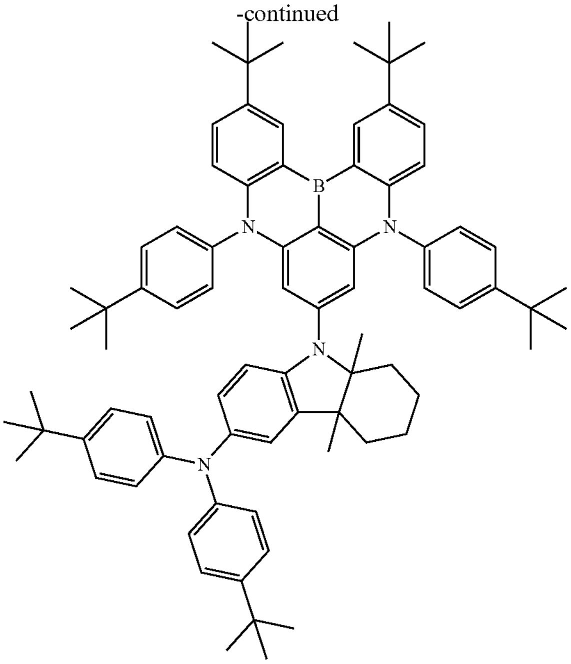
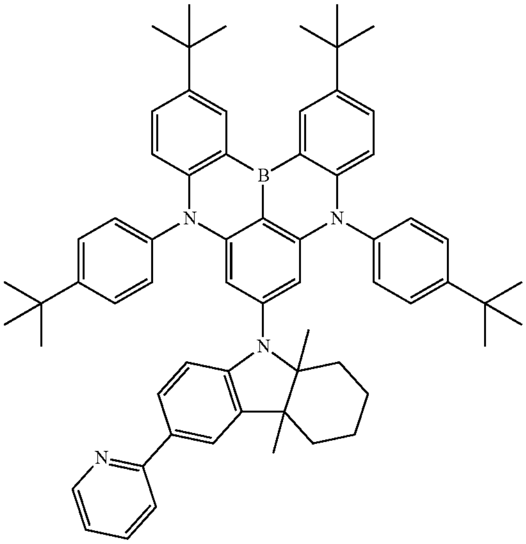
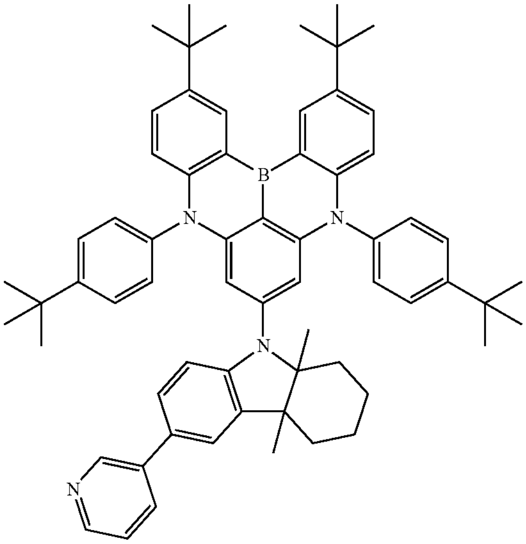
-continued
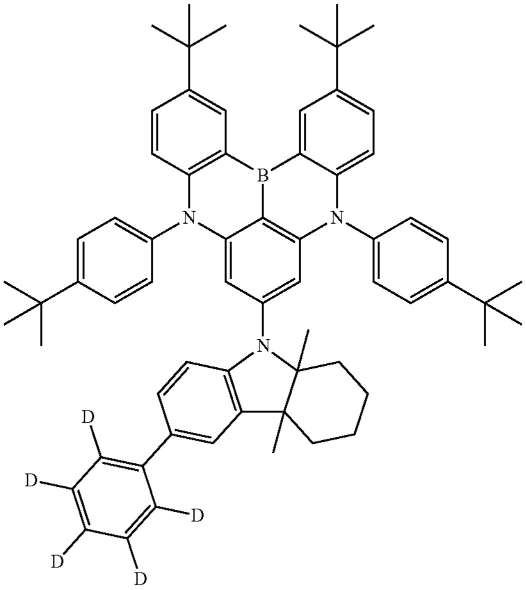
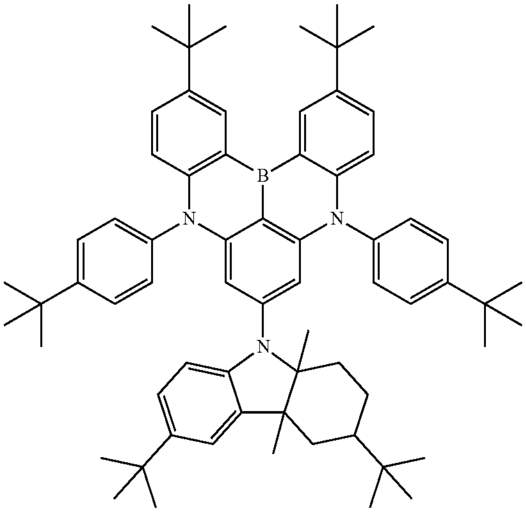
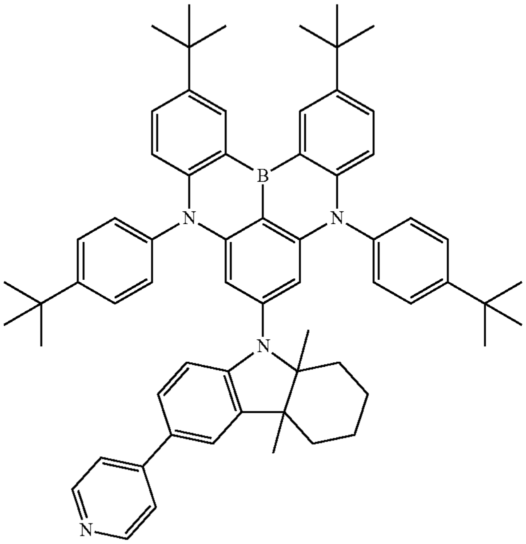

-continued
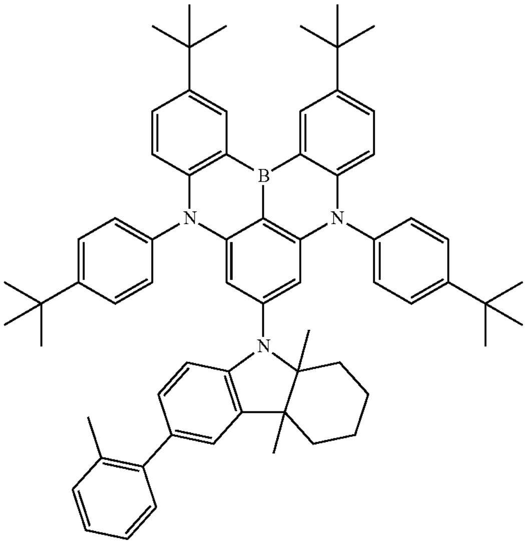
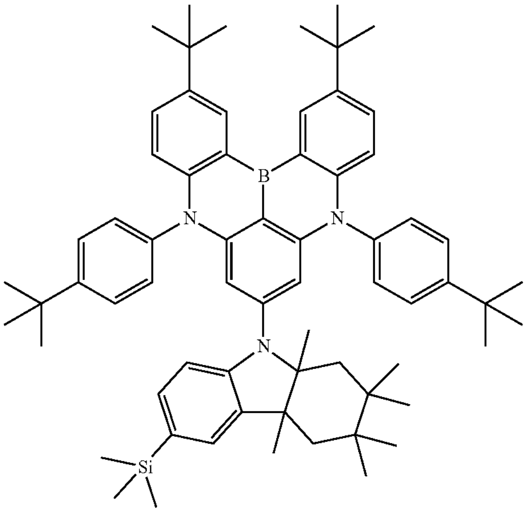
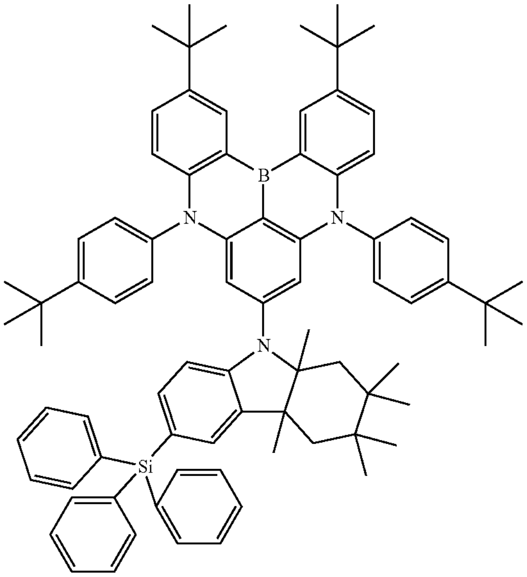
-continued
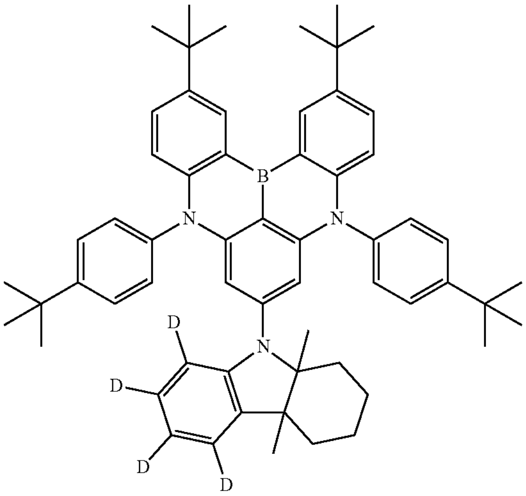
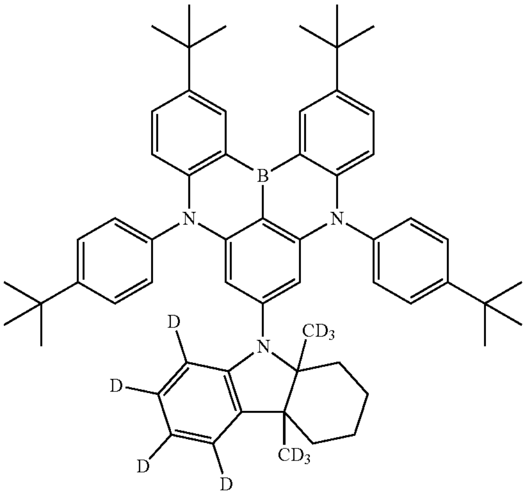
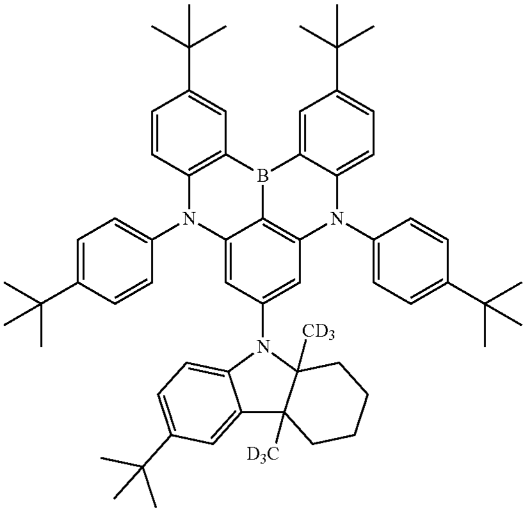

-continued
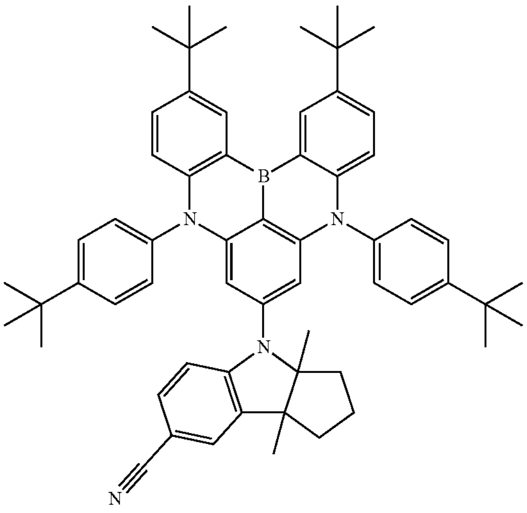
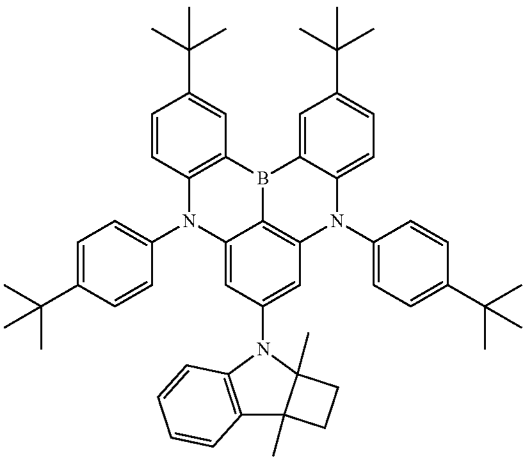
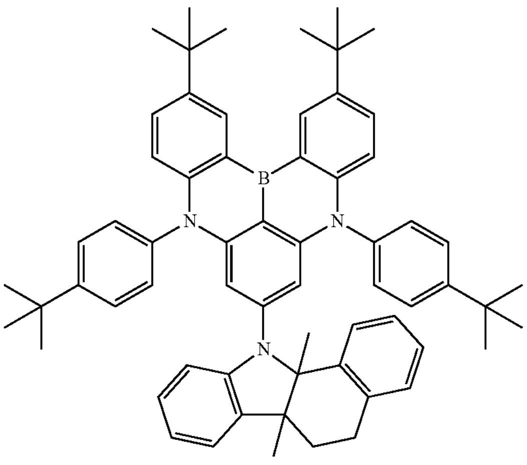
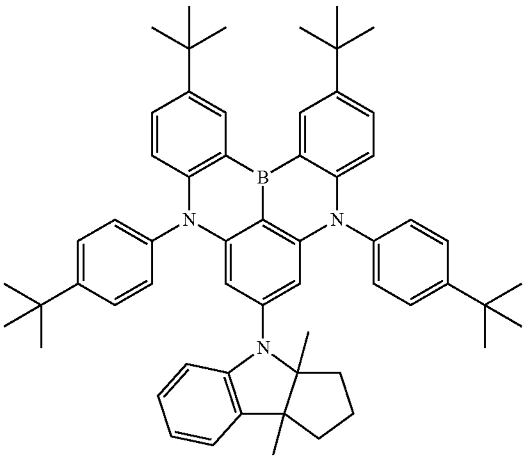
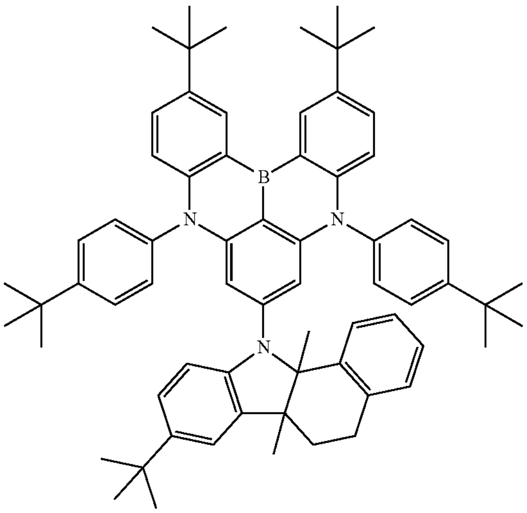
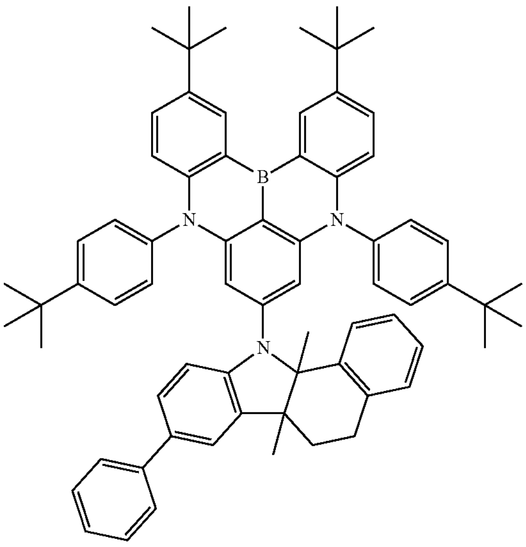
-continued -continued
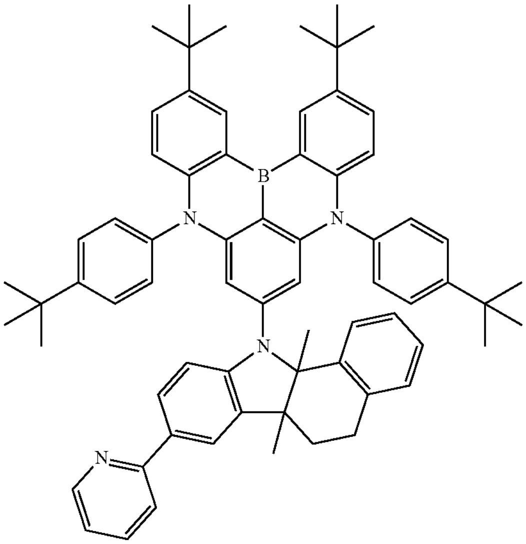
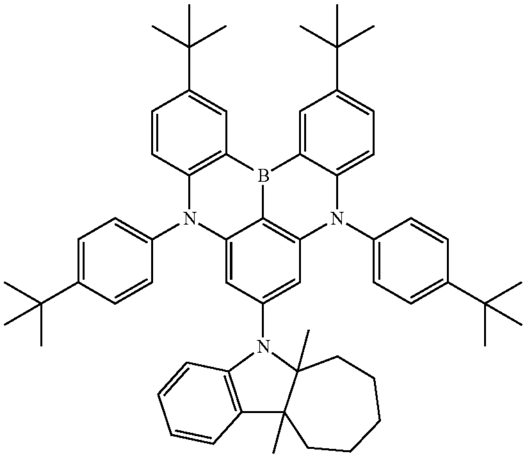
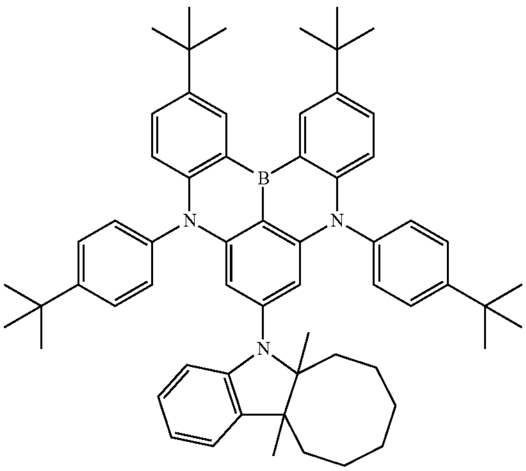
-continued
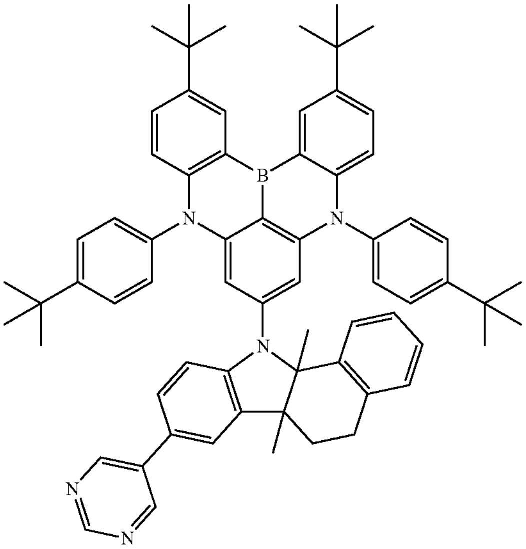
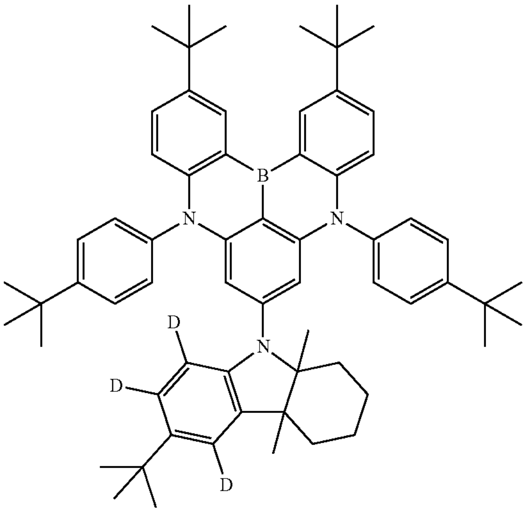
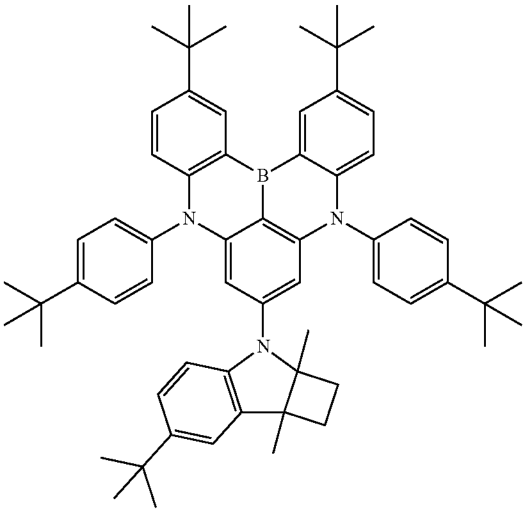

-continued
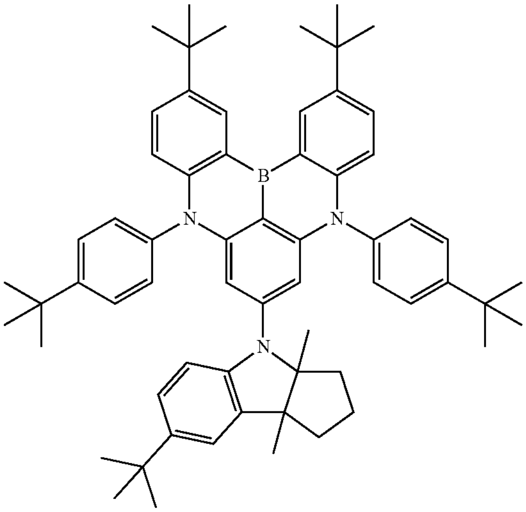
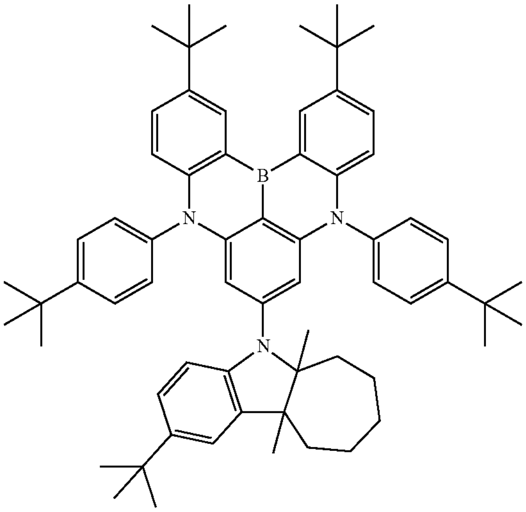
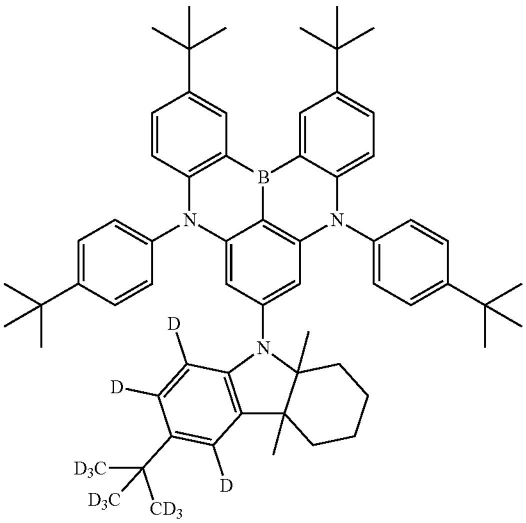
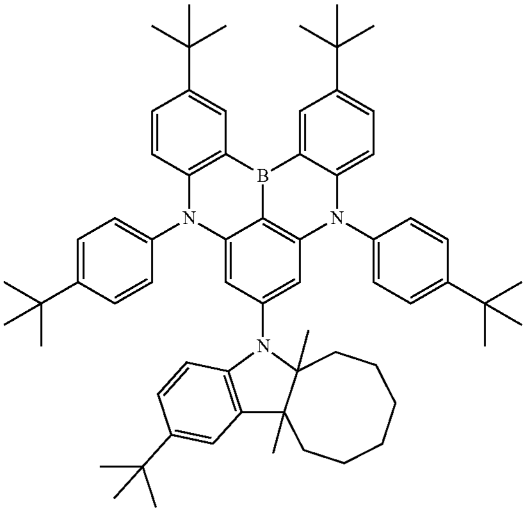
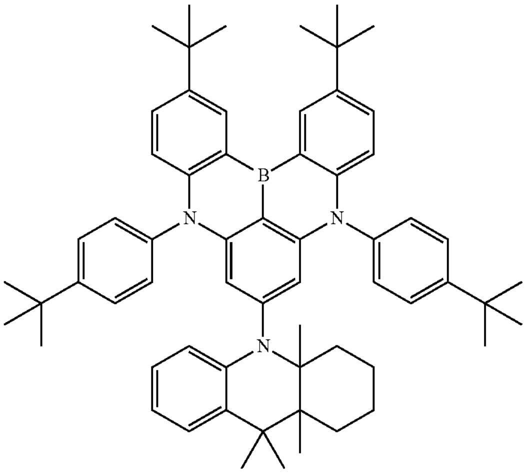
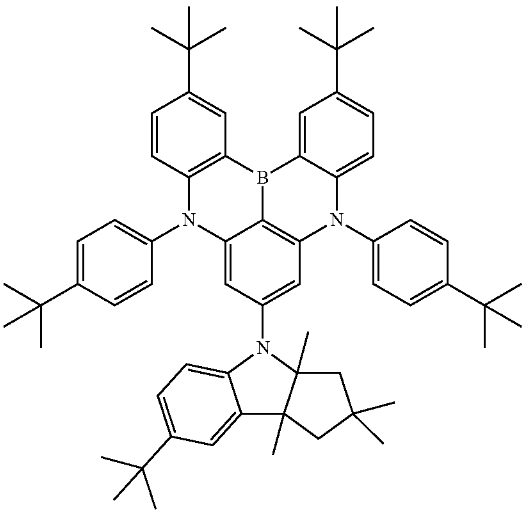
-continued -continued
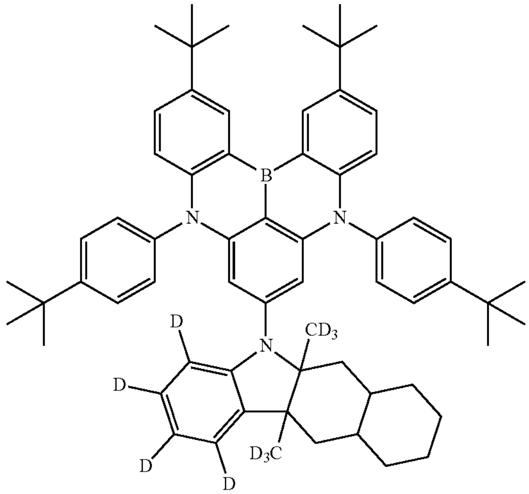
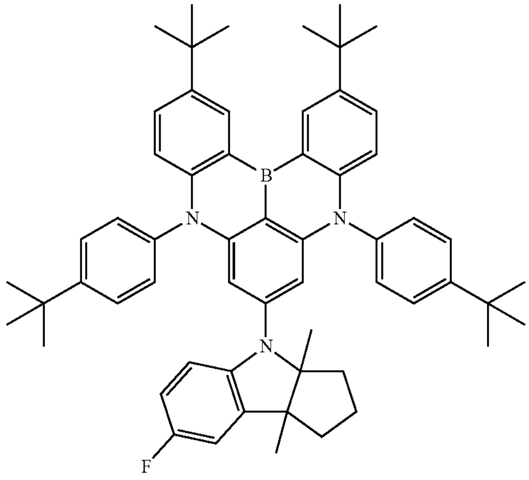
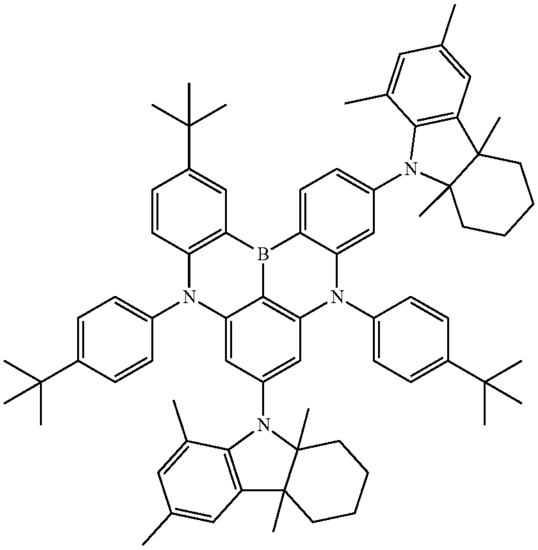
-continued
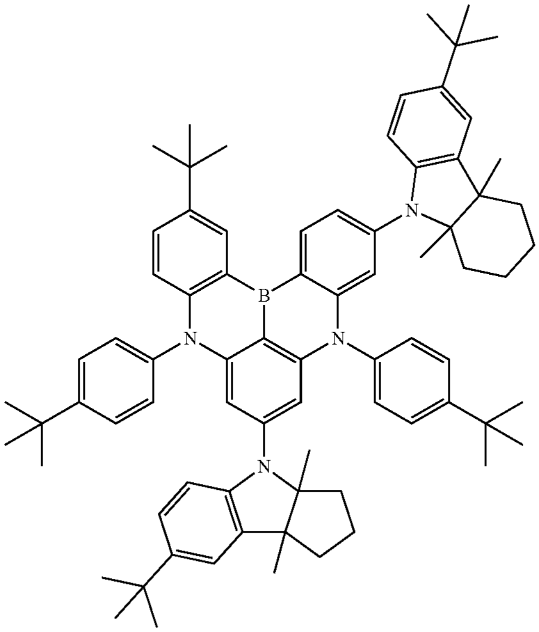
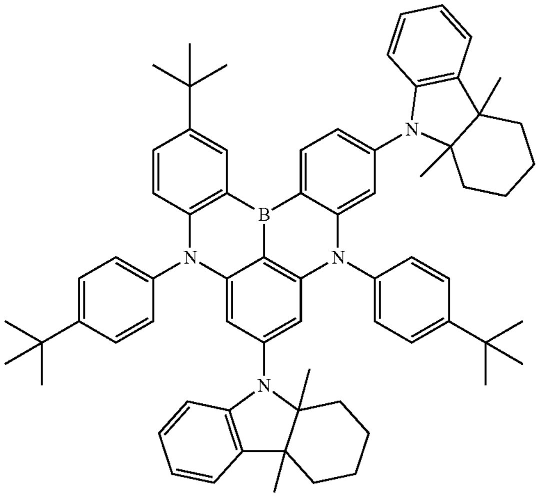
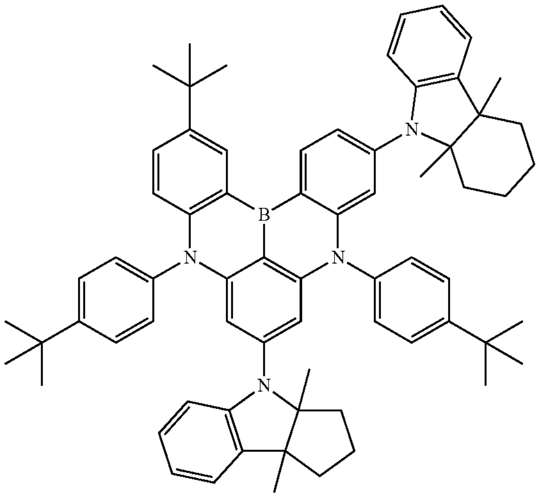

-continued
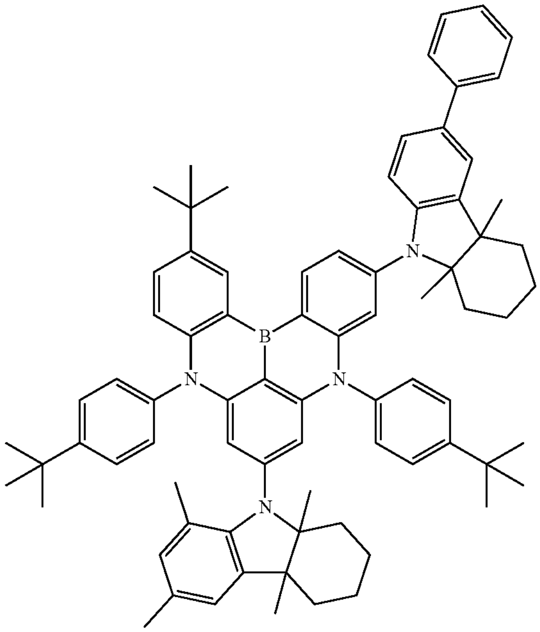
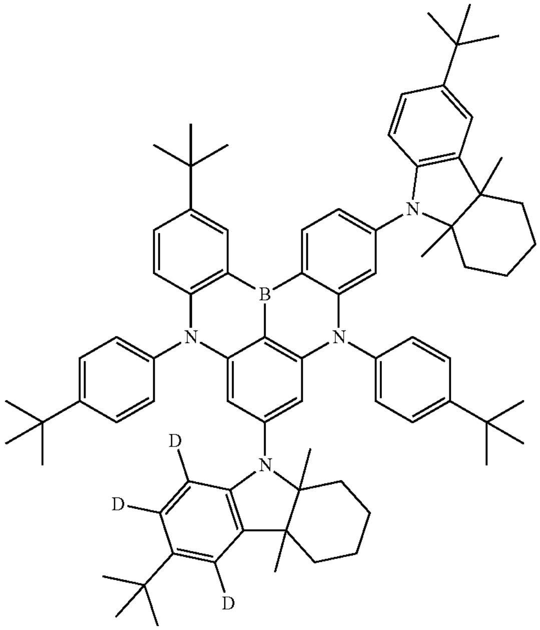
-continued
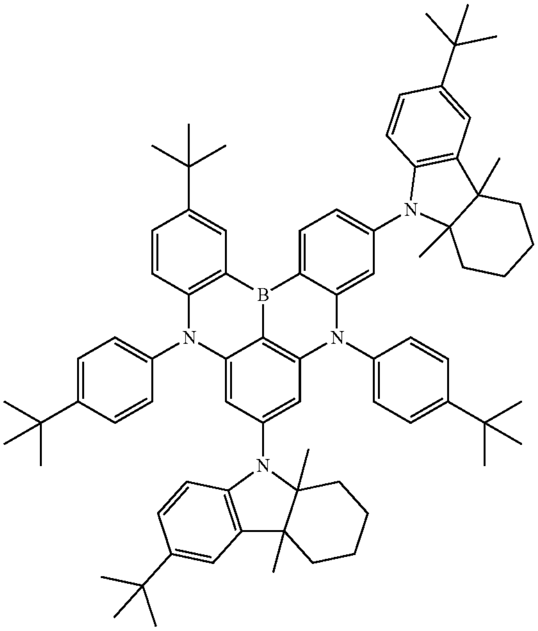
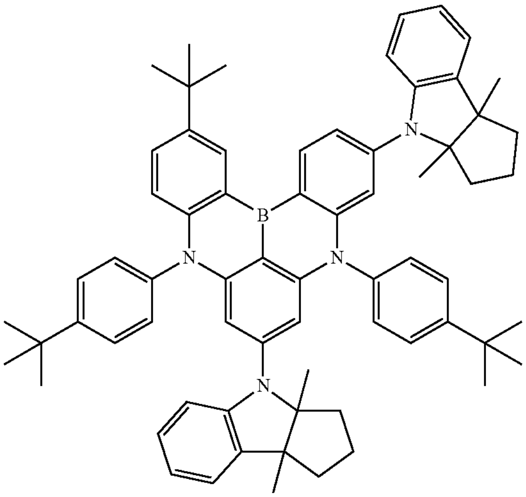

-continued
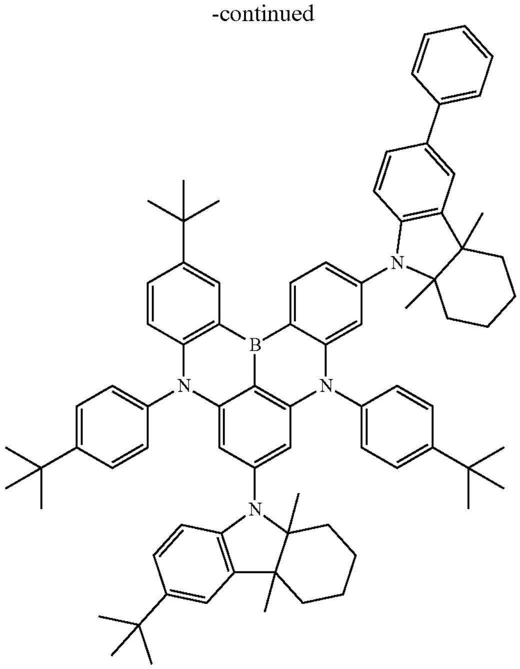
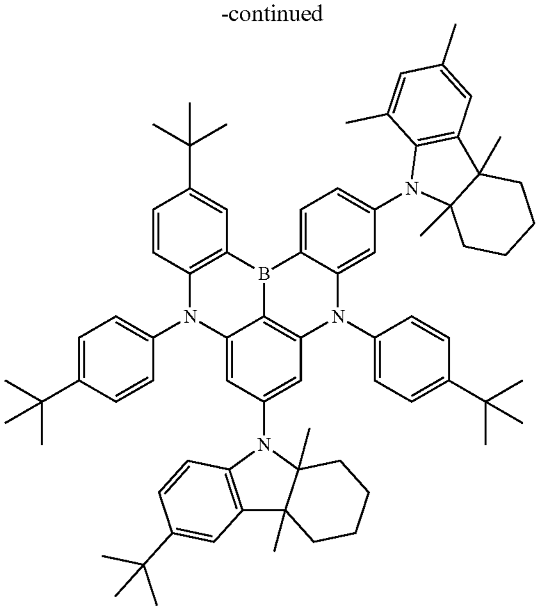
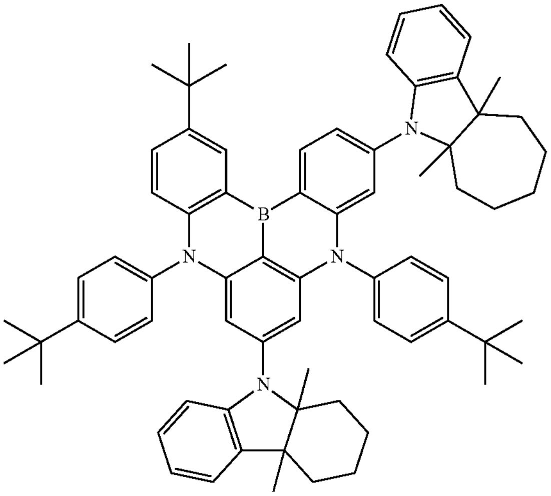
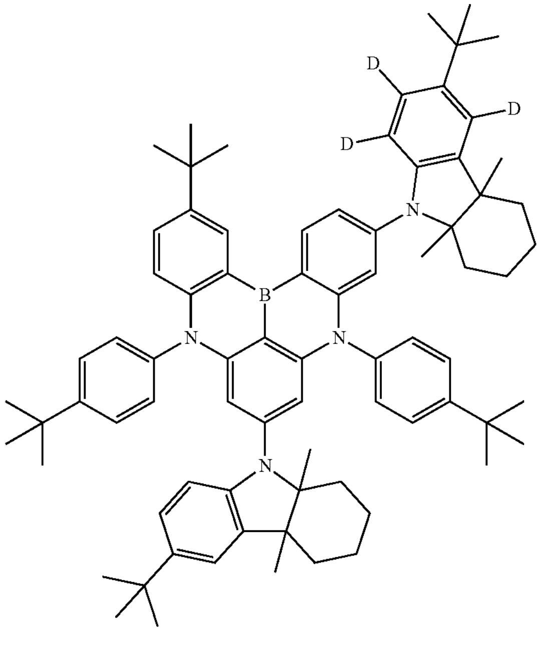
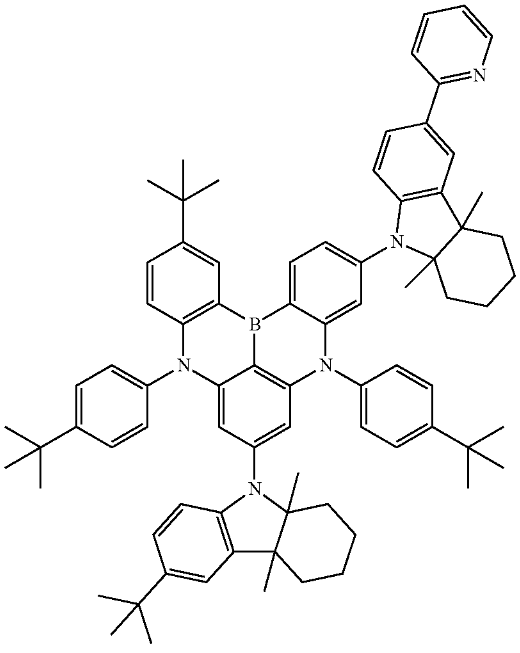

-continued
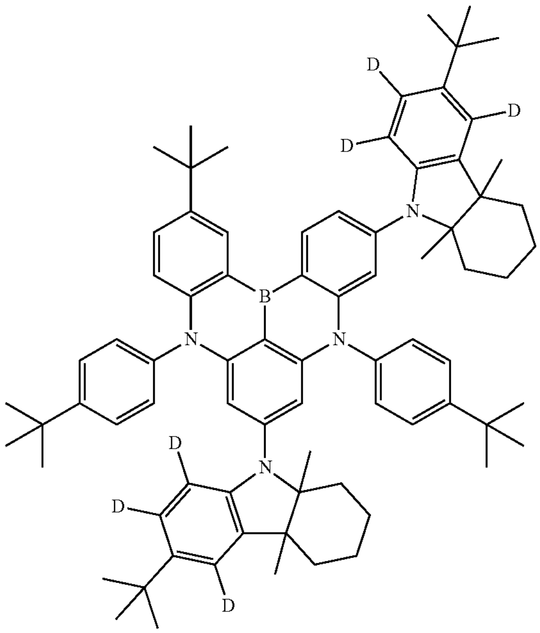
-continued
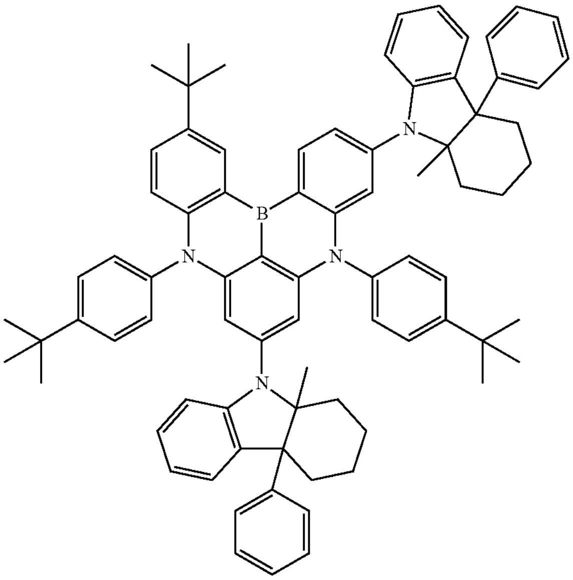
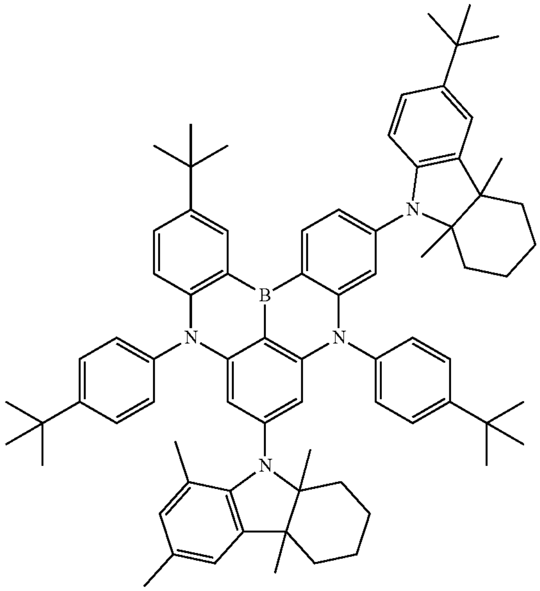
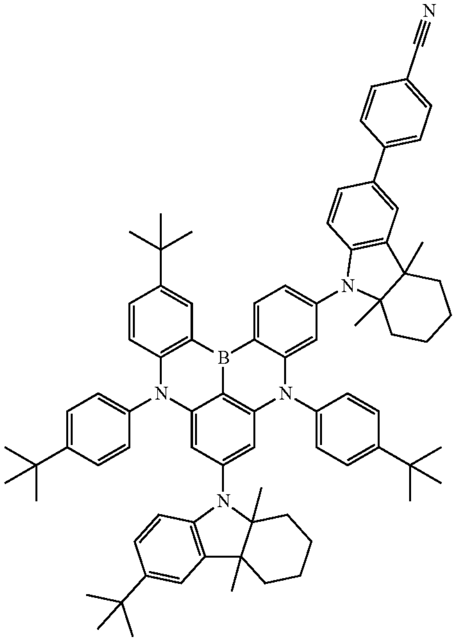

-continued
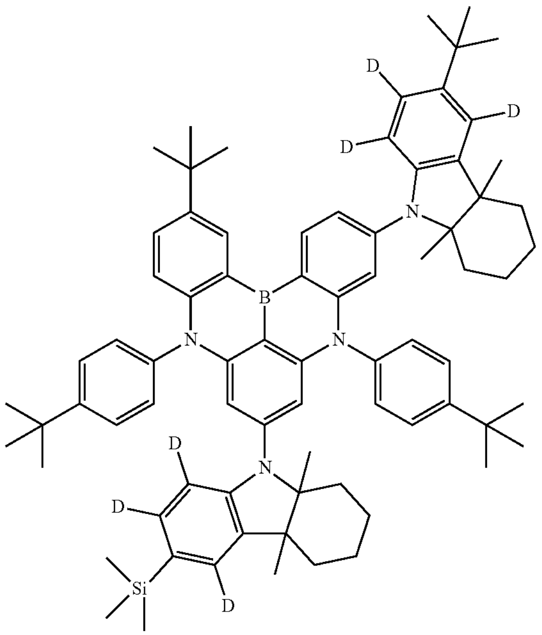
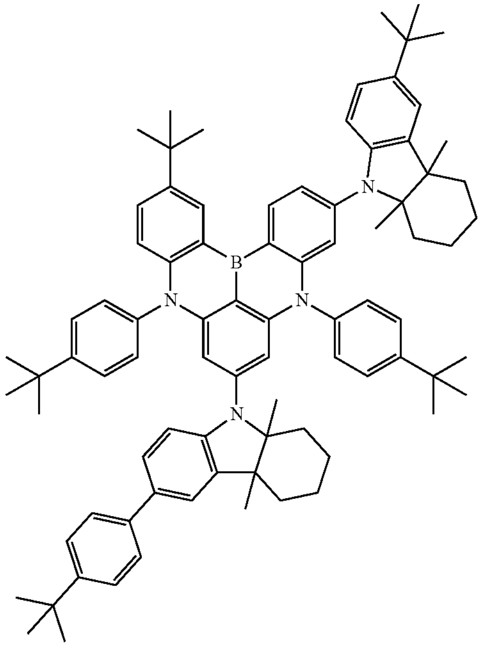
-continued
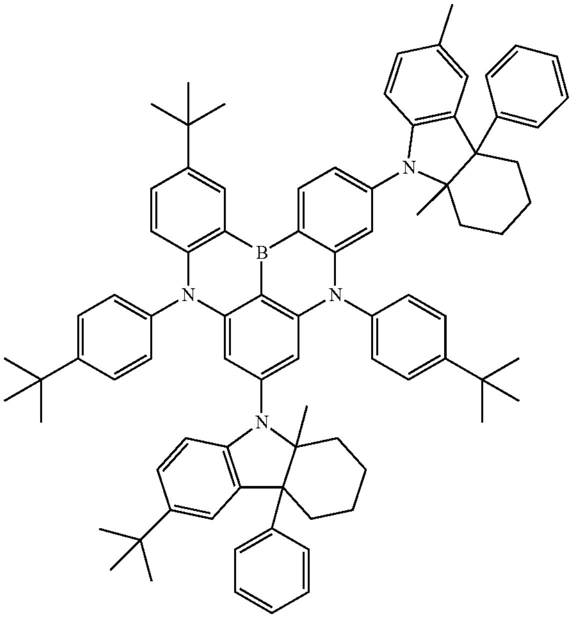
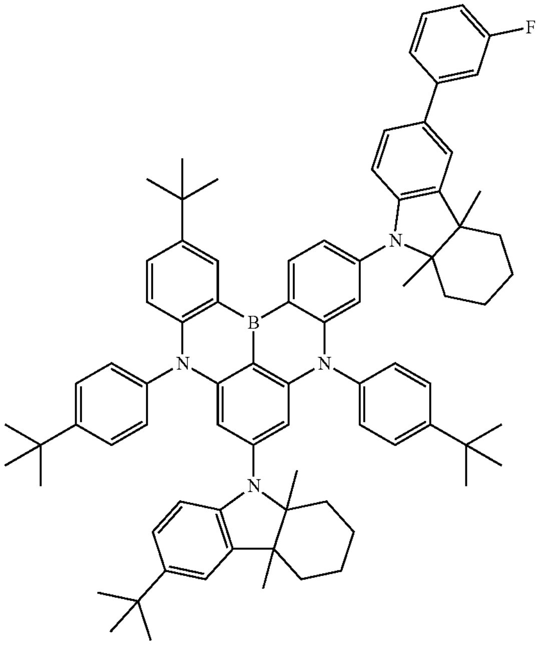

-continued
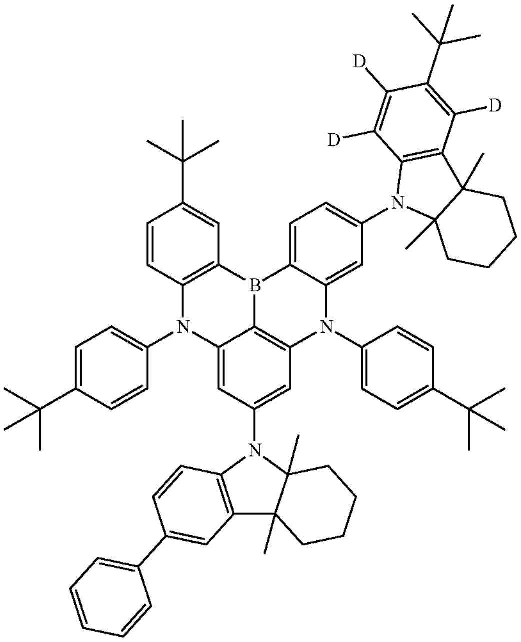
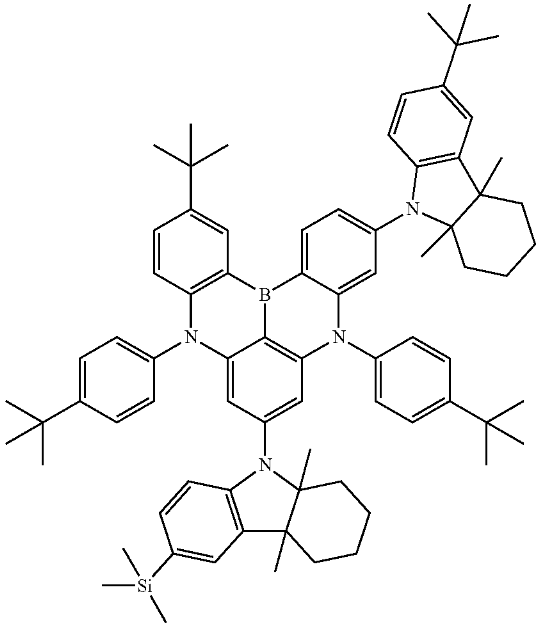
-continued
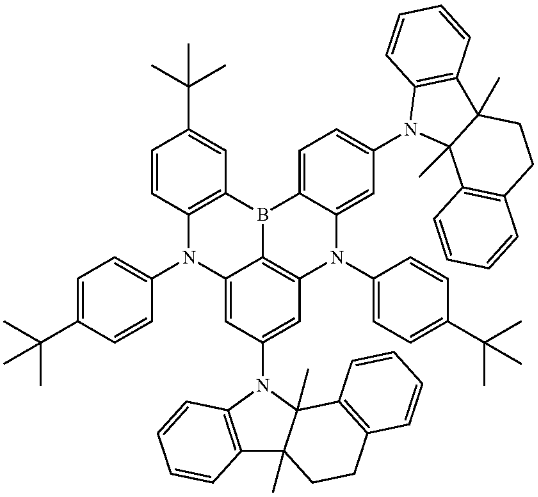
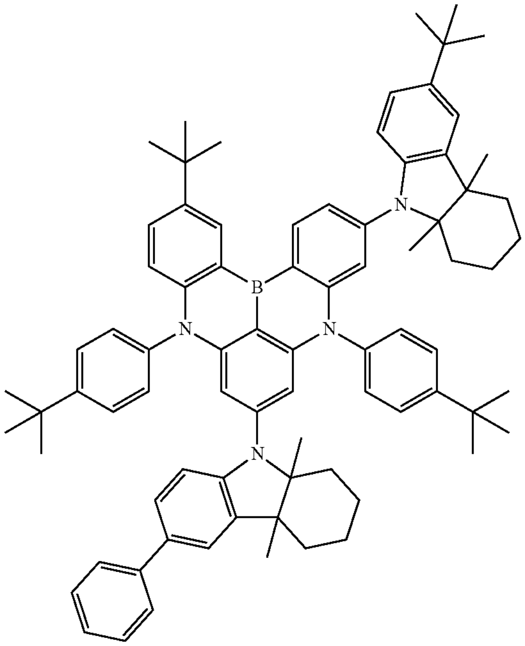

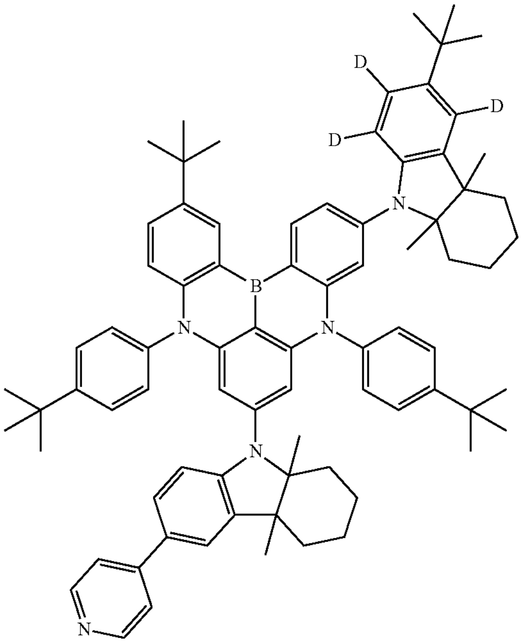
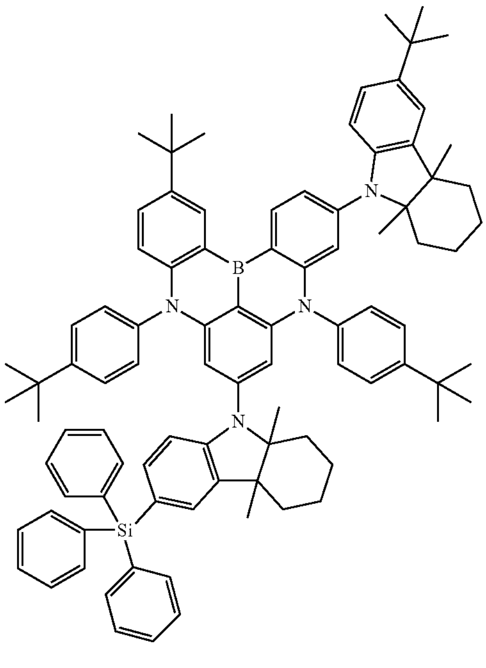
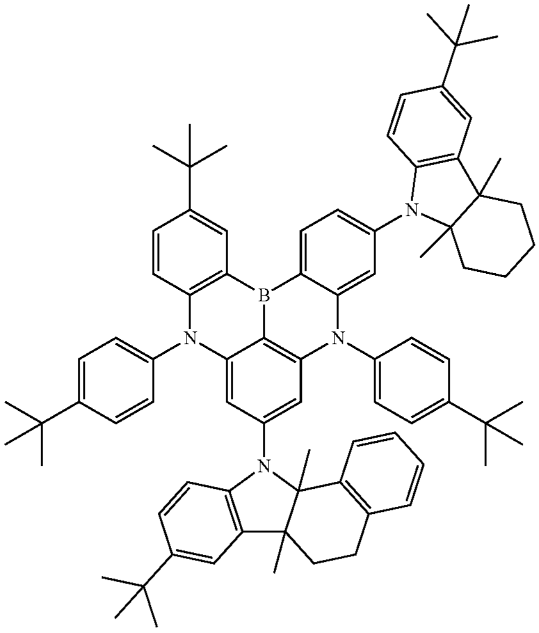
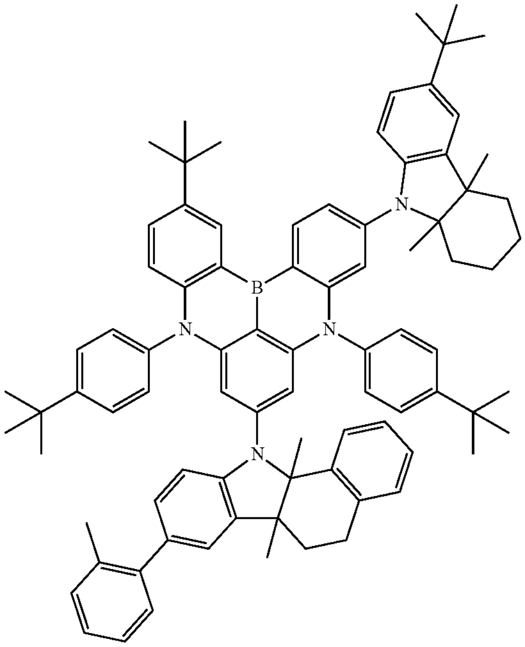

-continued
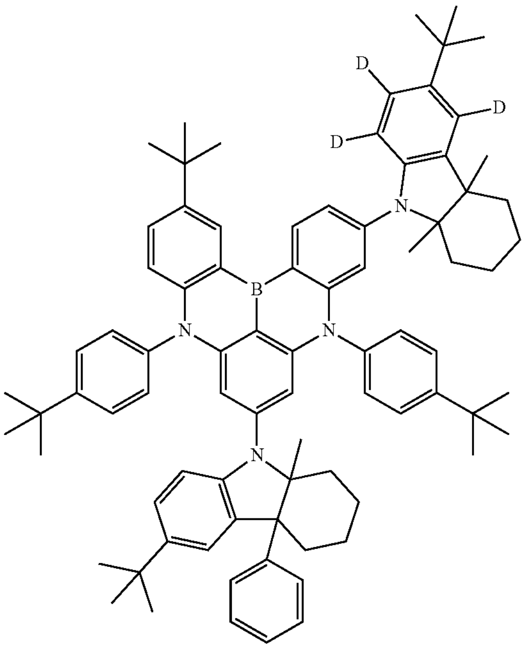
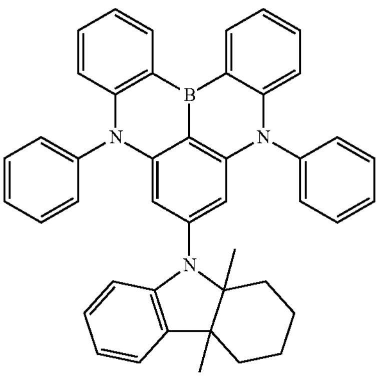
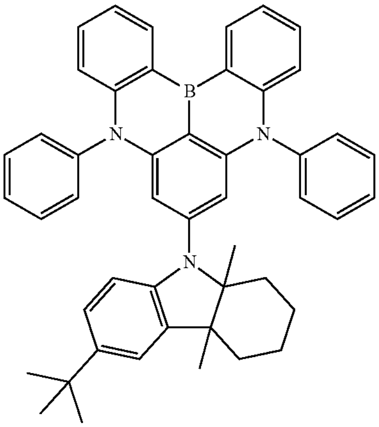
-continued
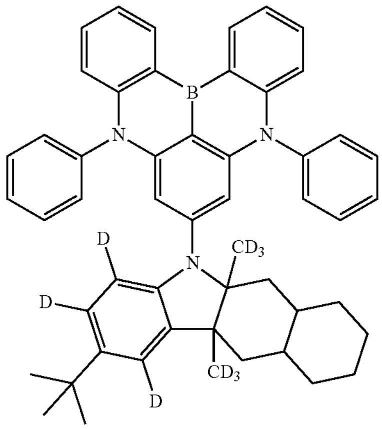
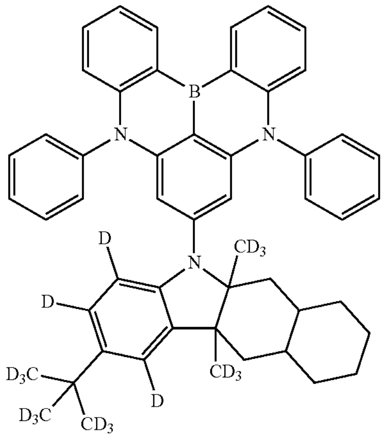
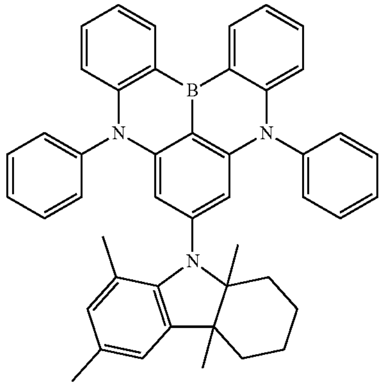
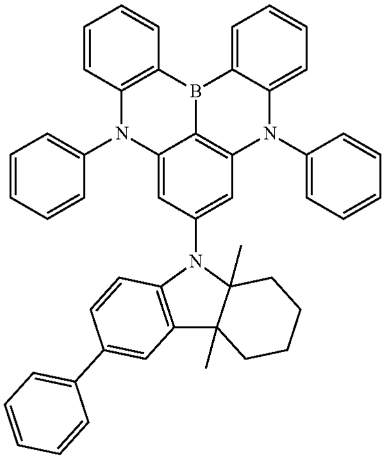

-continued
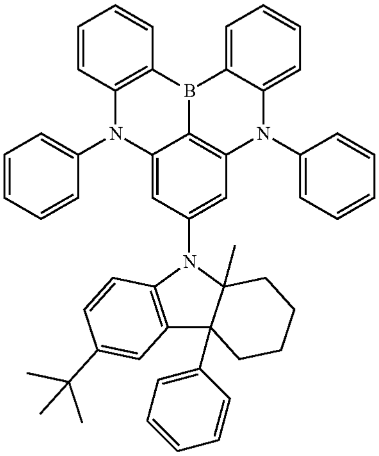
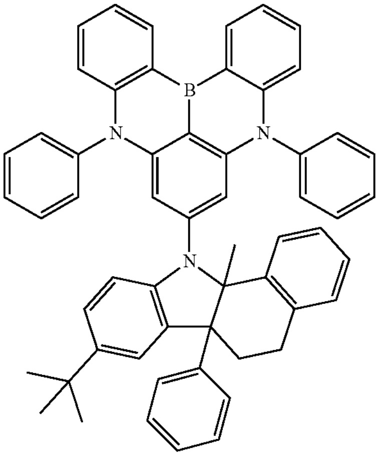
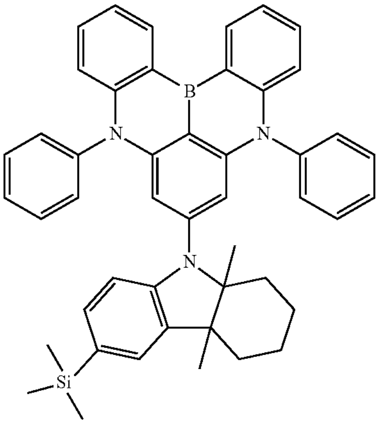
-continued
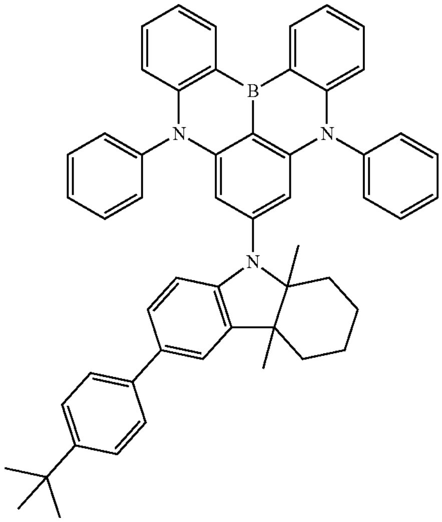
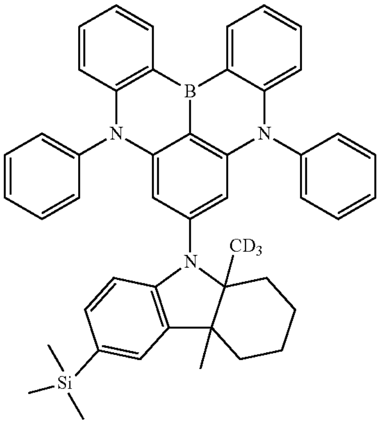
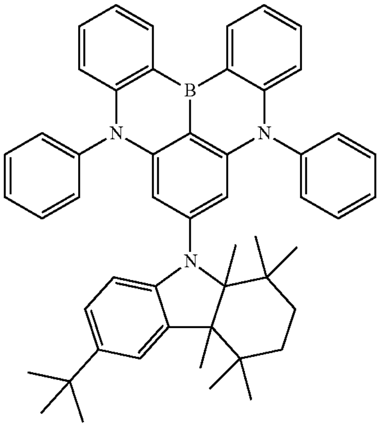

-continued
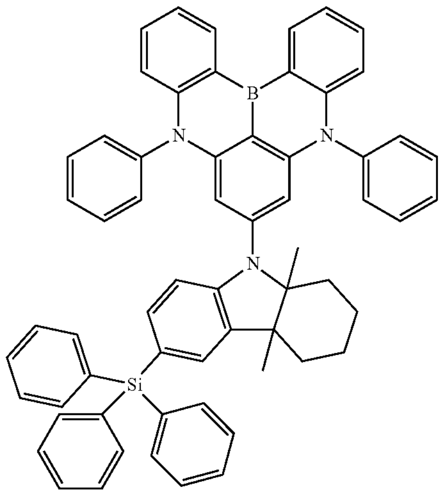
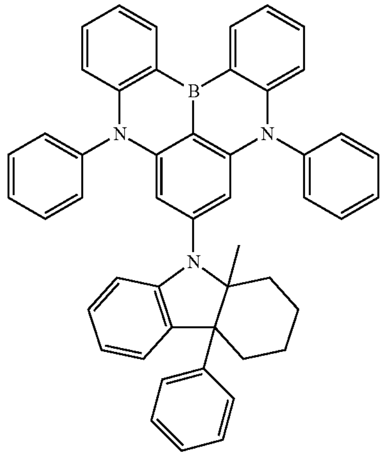
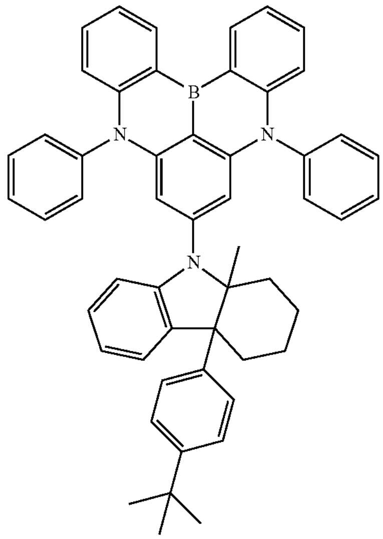
-continued
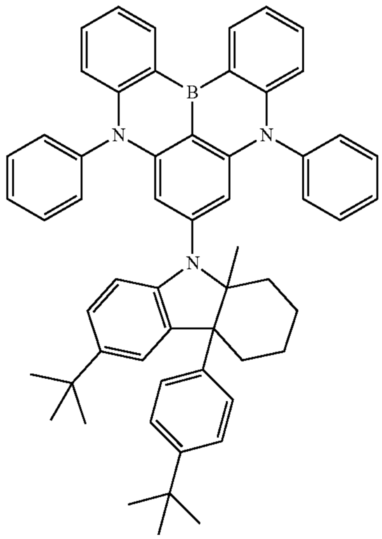
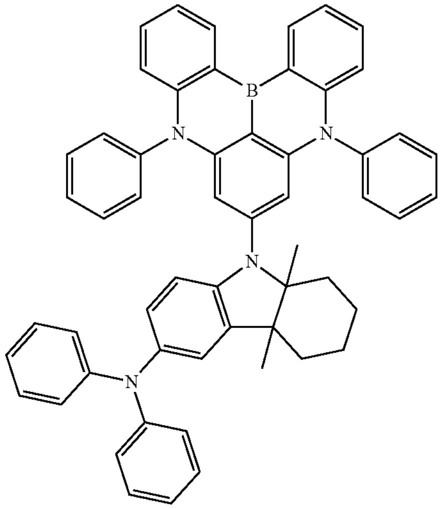
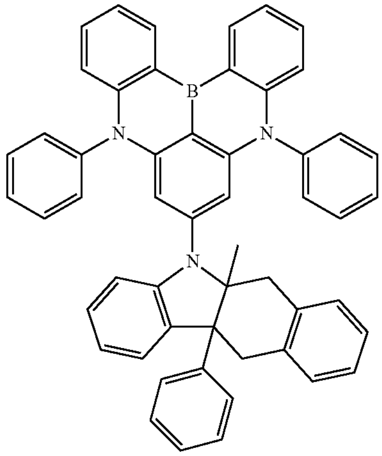

-continued
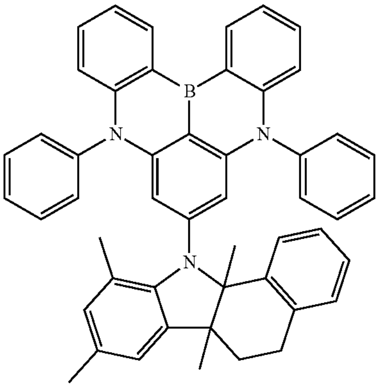
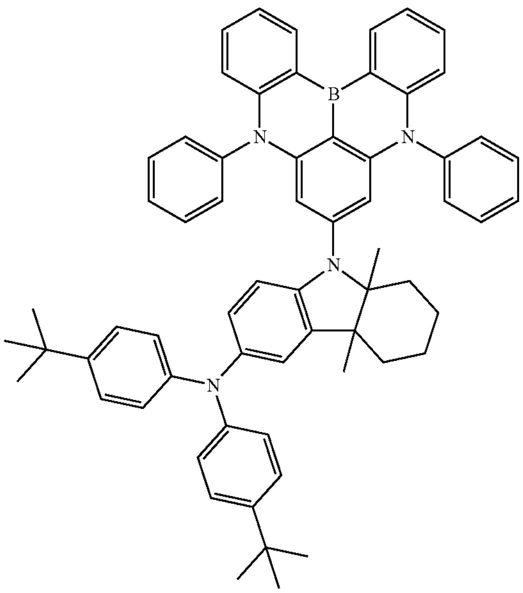
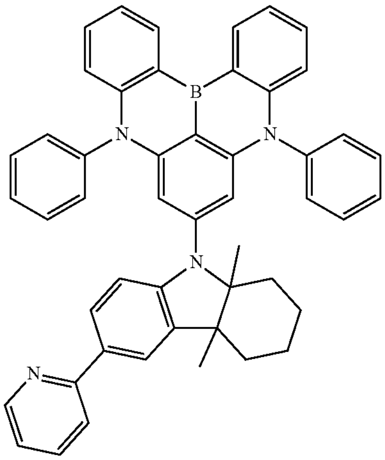
-continued
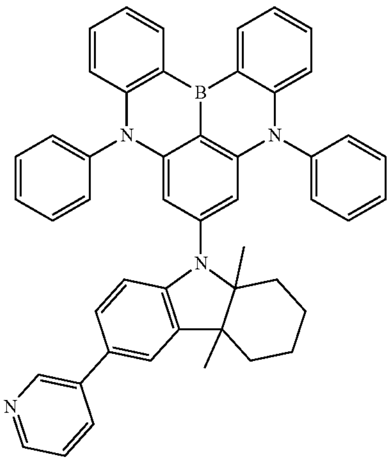
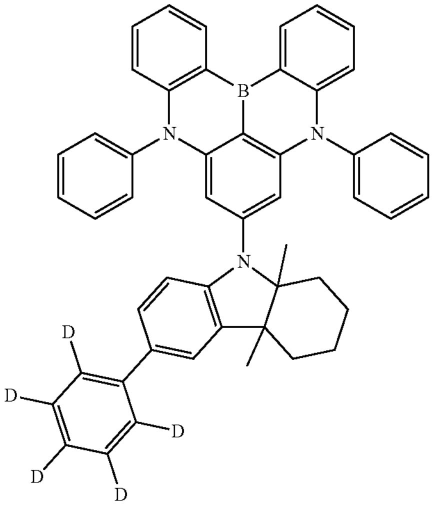
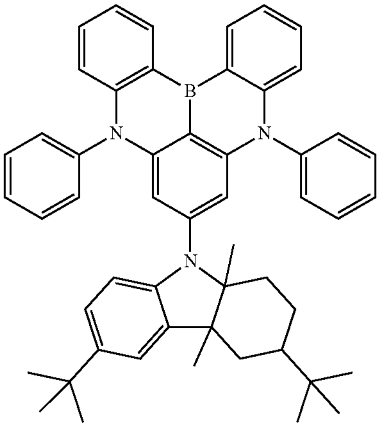

-continued
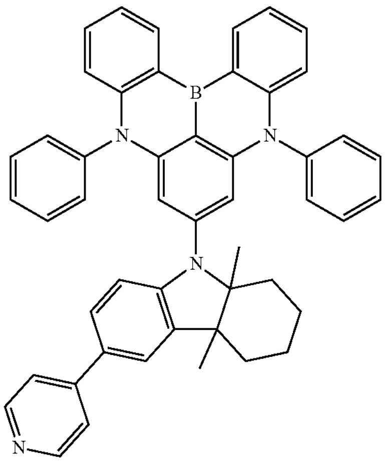
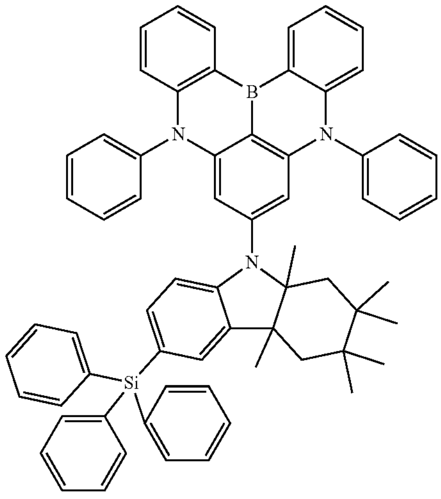
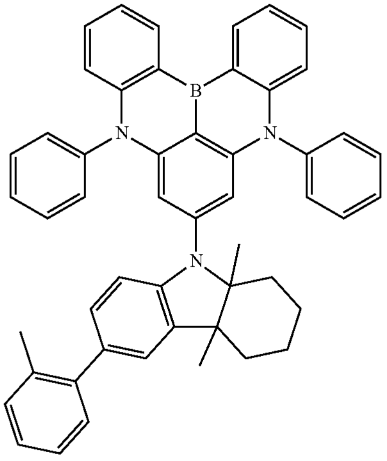
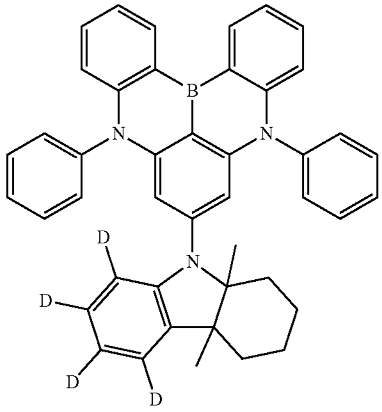
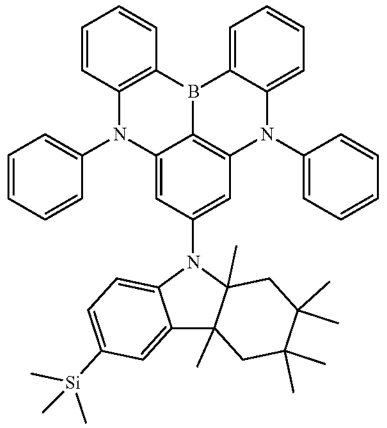
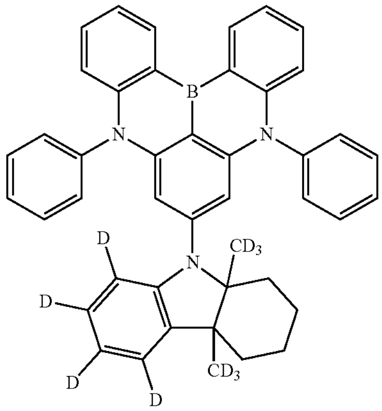

-continued
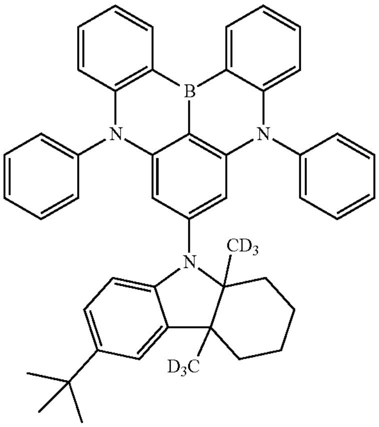
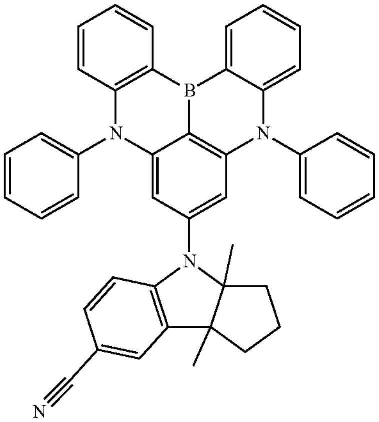
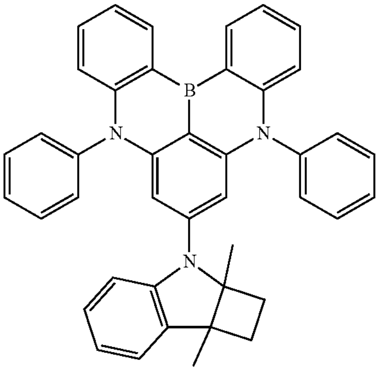
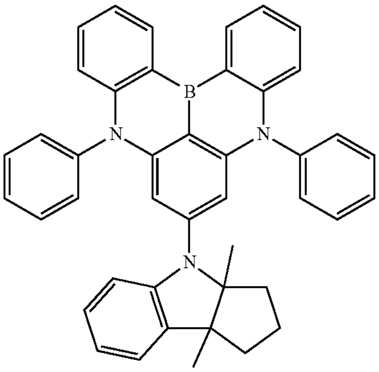
-continued
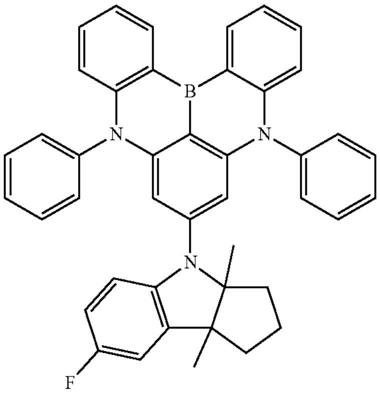
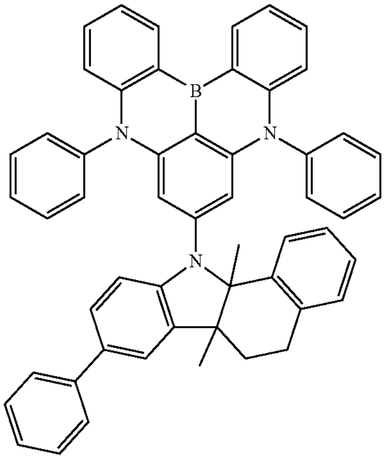
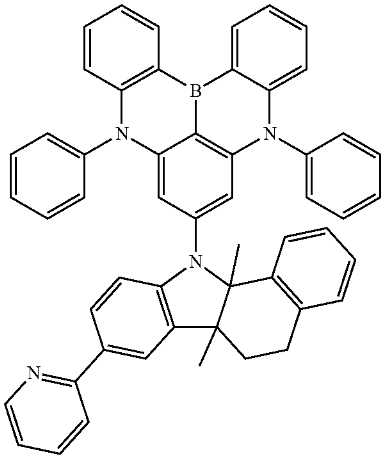
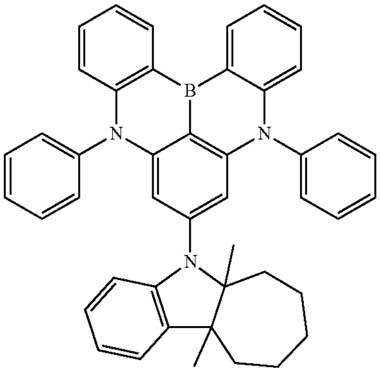

-continued
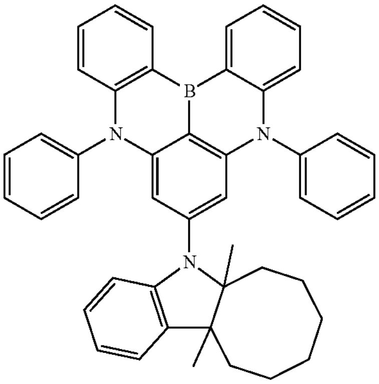
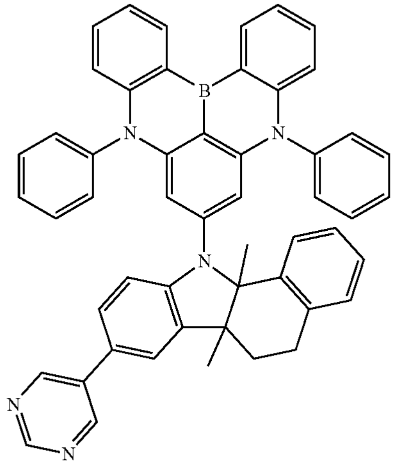
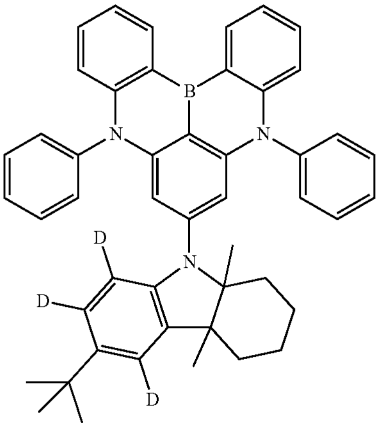
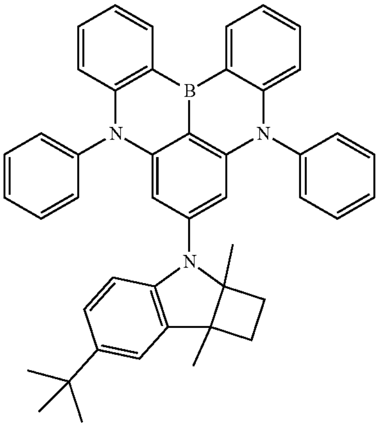
-continued
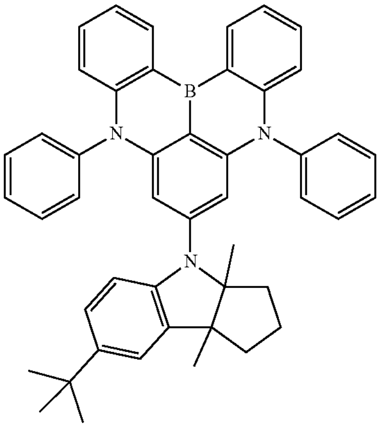
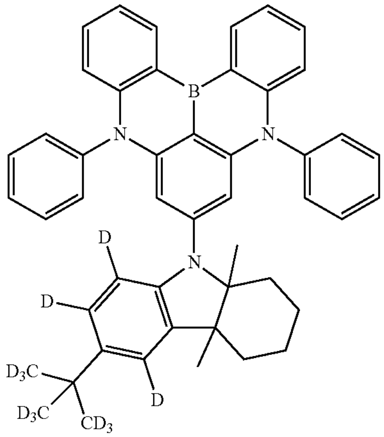
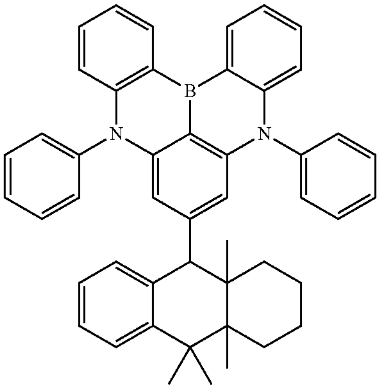
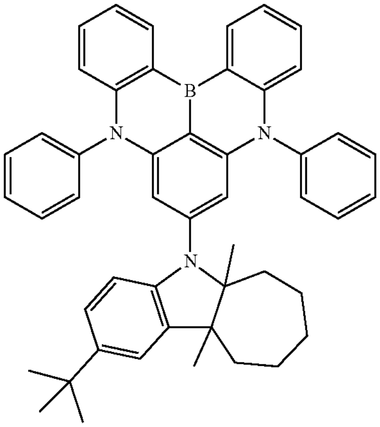

-continued
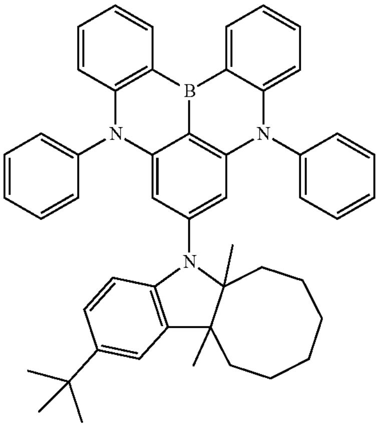
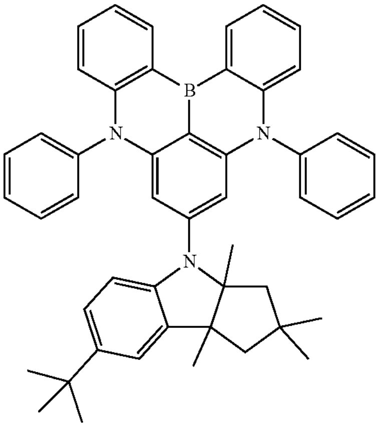
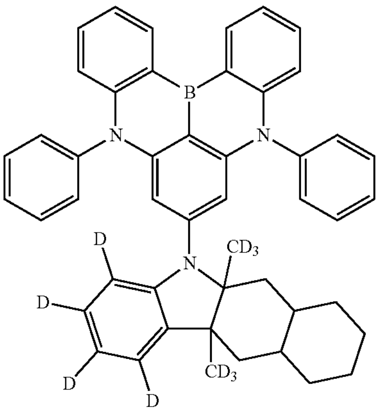
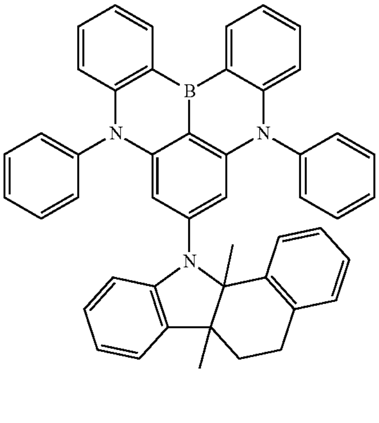
-continued
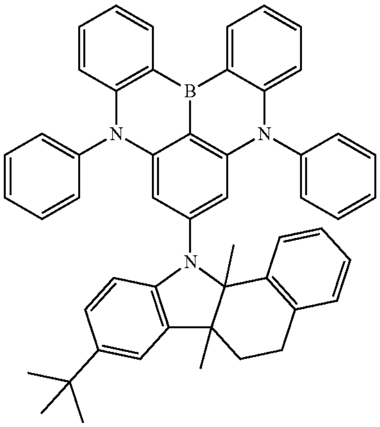 [SMILES: CC(C)(C)c1ccc2c(c1)C1(C)CCc3ccccc3C1(C)N2c1cc2c3c(c1)N(c1ccccc1)c1ccccc1B3c1ccccc1N2c1ccccc1]
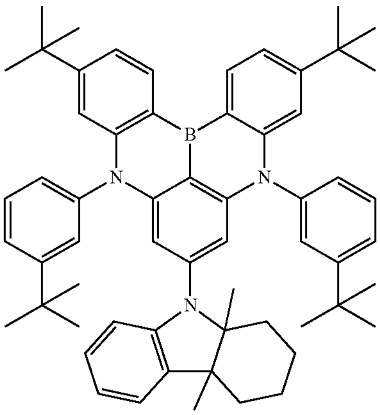
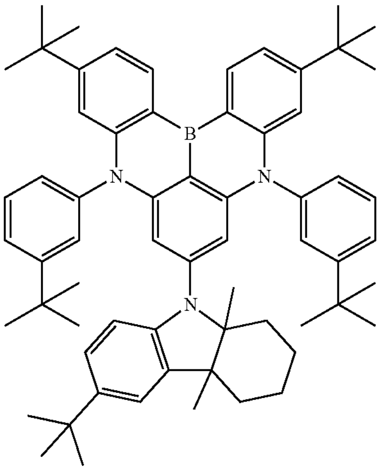

-continued
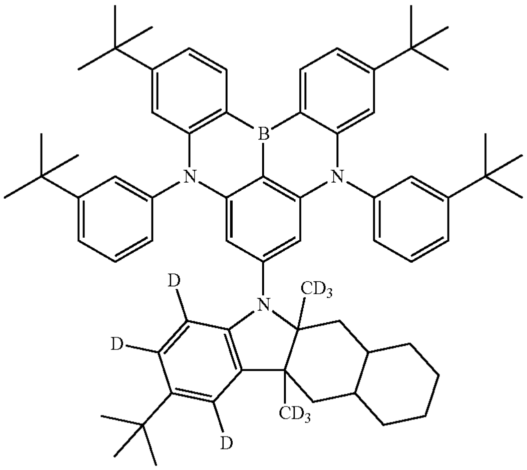
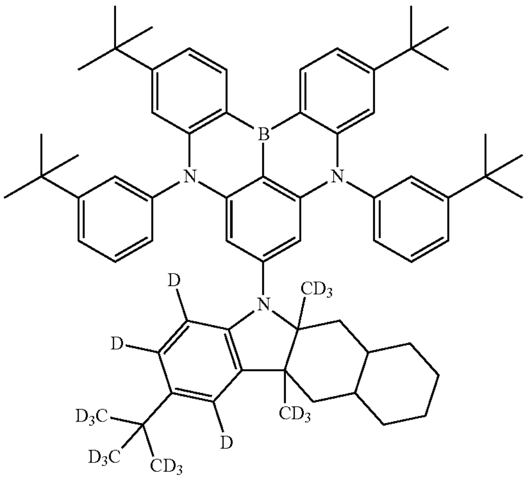
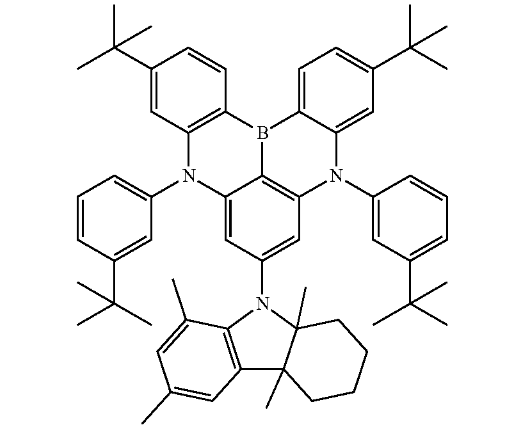
-continued
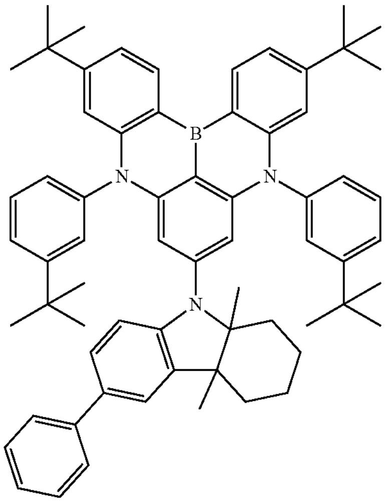
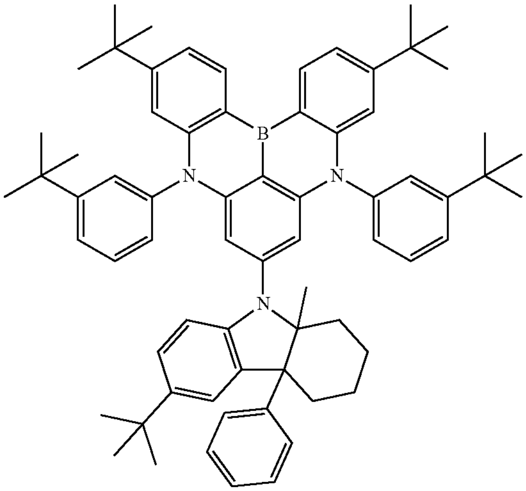
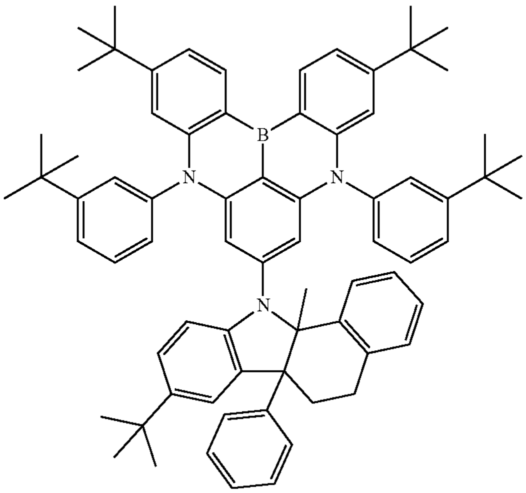

-continued
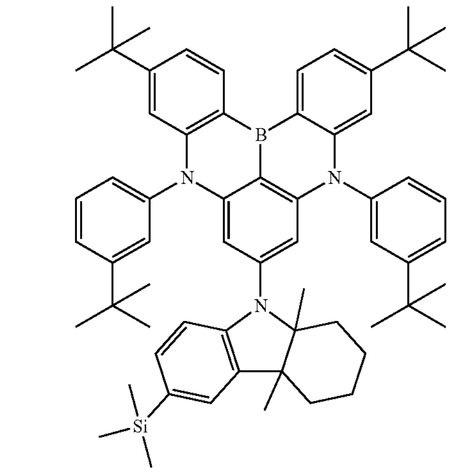
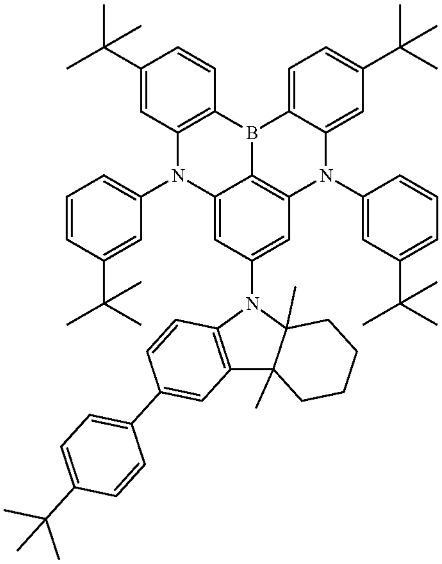
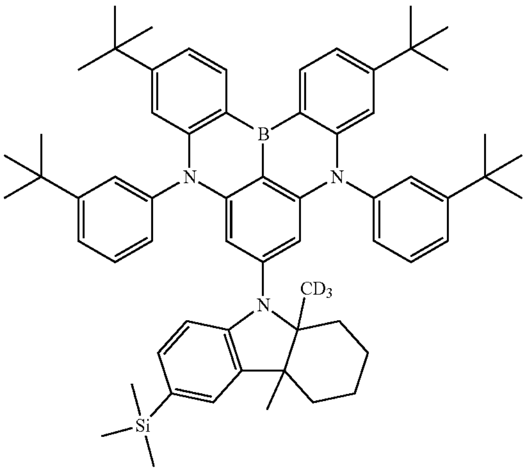
-continued
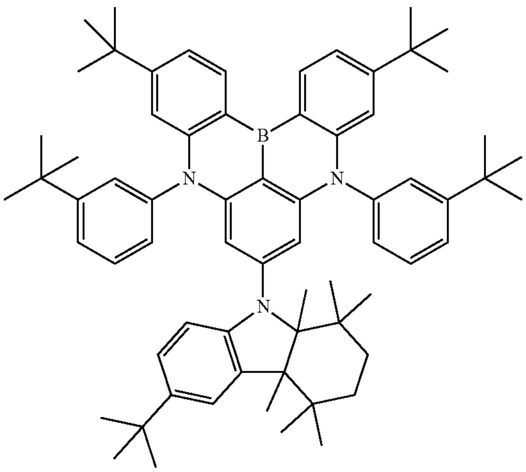
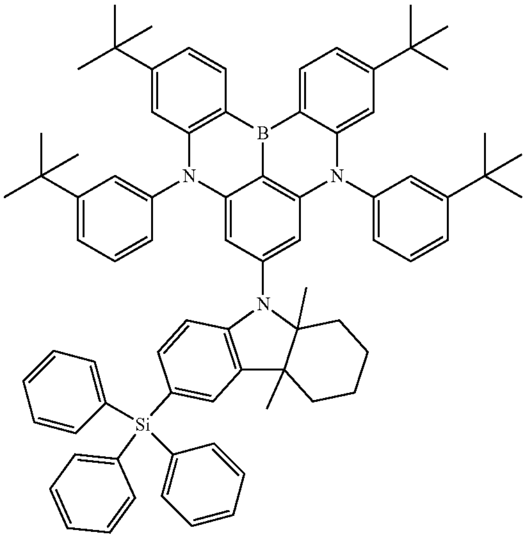
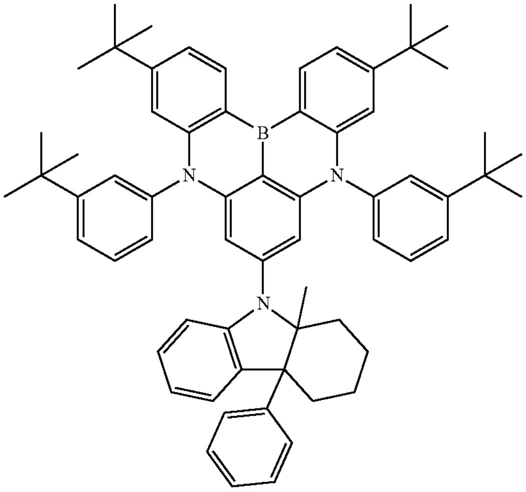

-continued
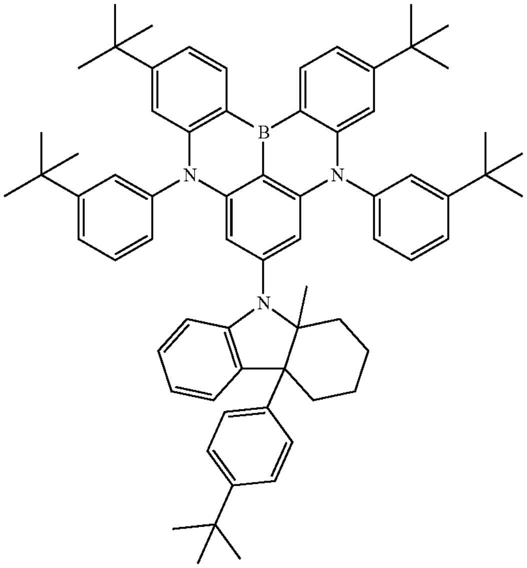
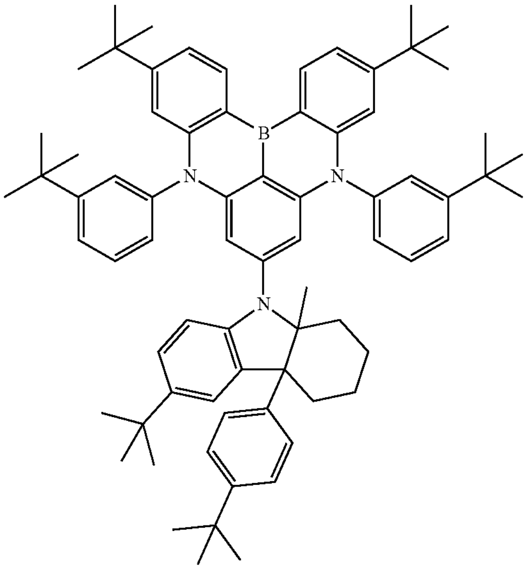
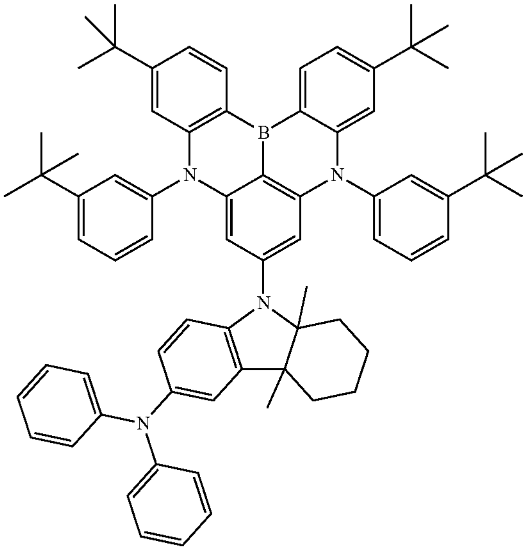
-continued
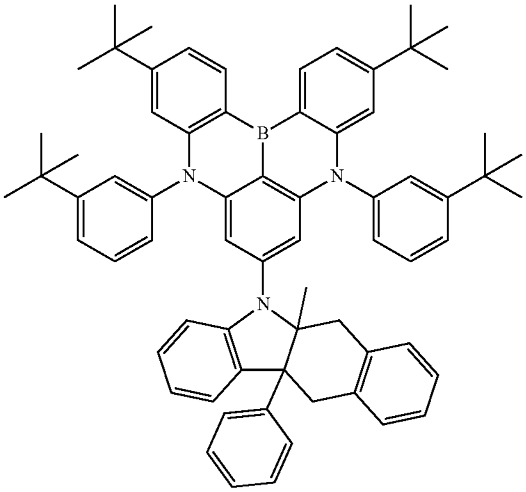
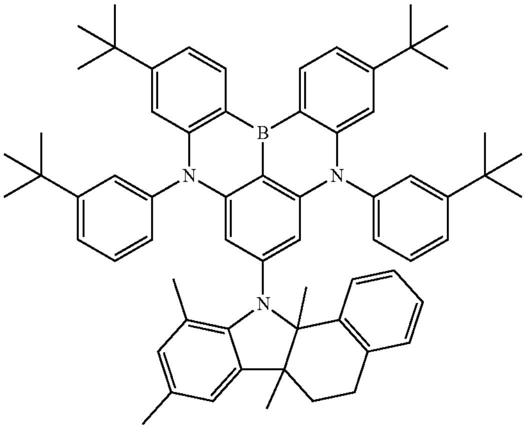
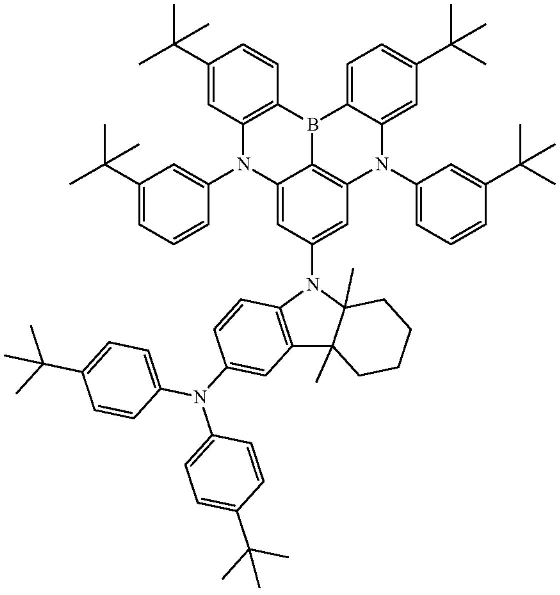

-continued
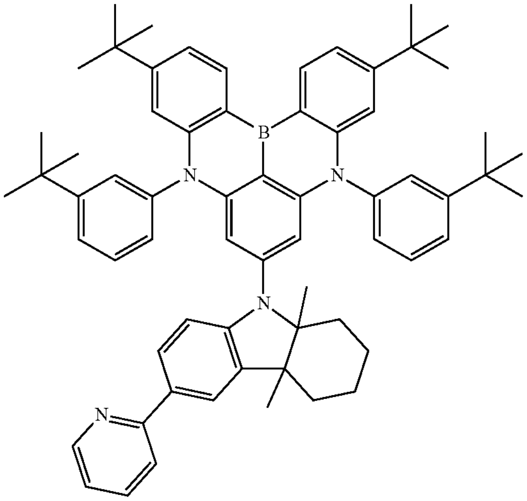
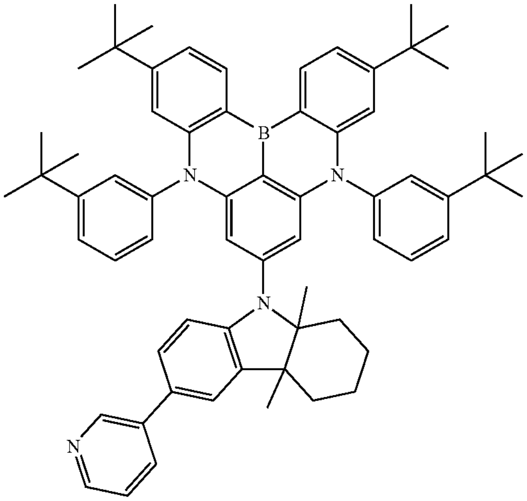
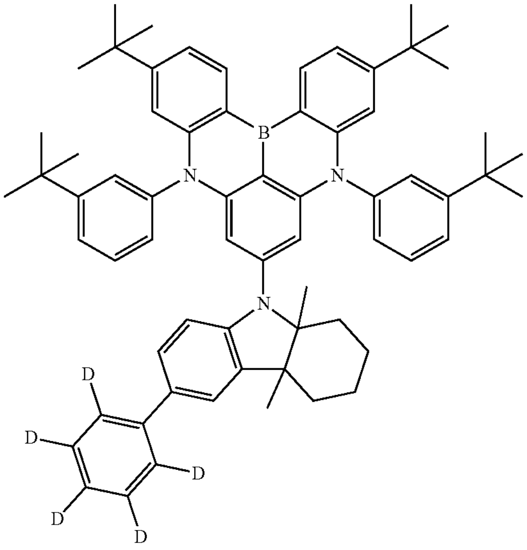
-continued
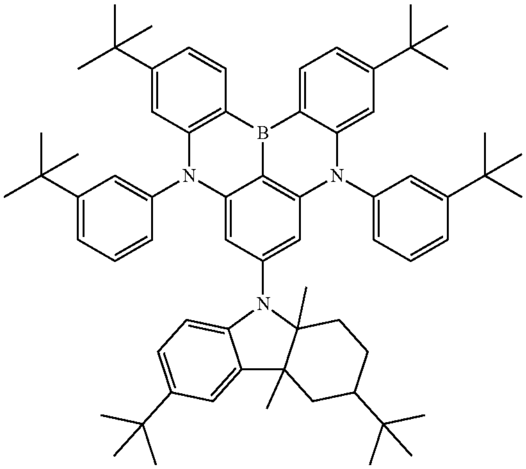
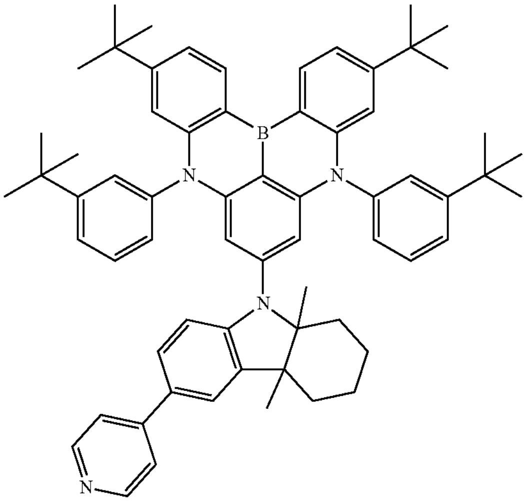
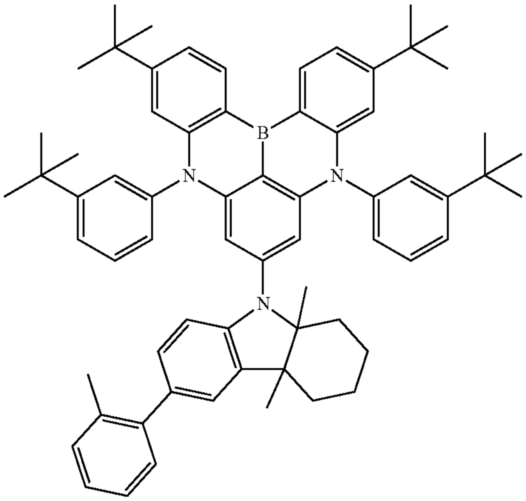

-continued
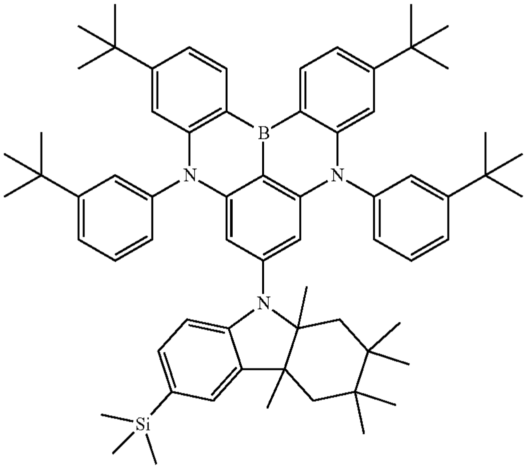
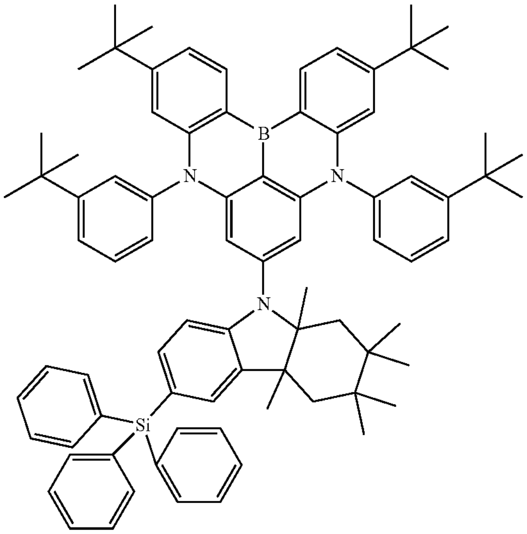
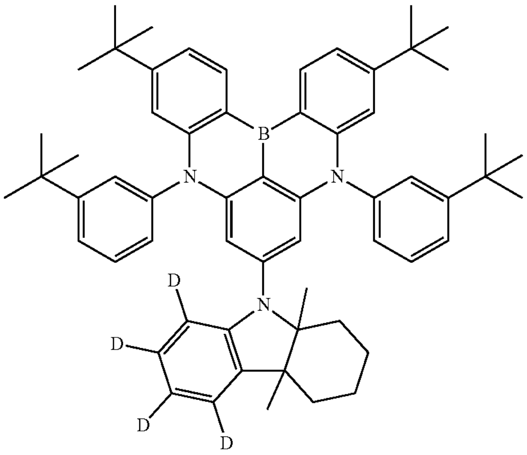
-continued
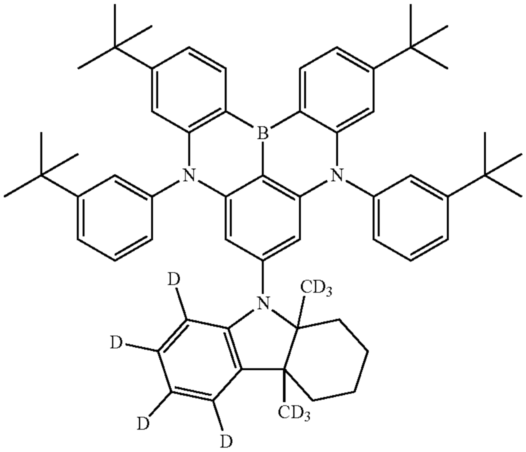
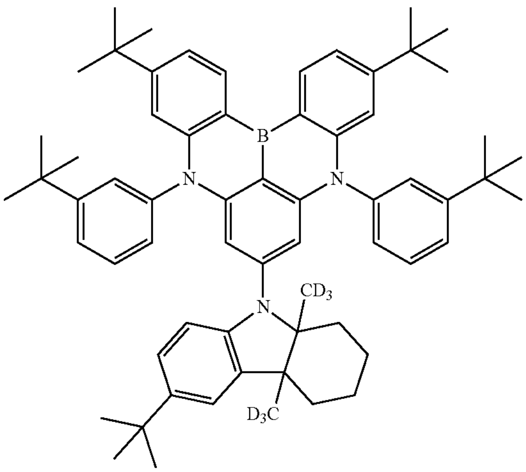
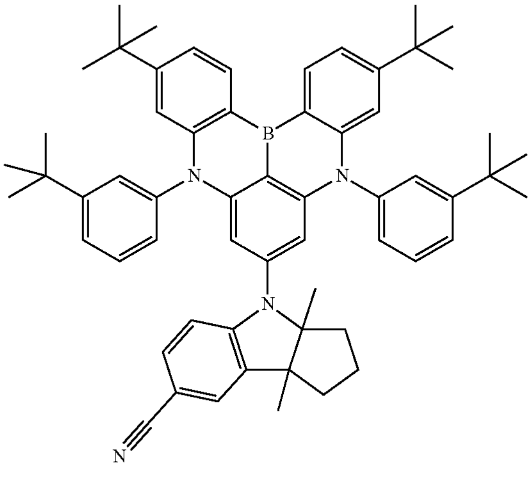

-continued
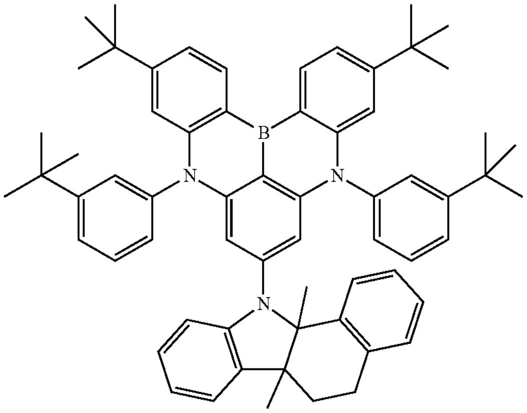
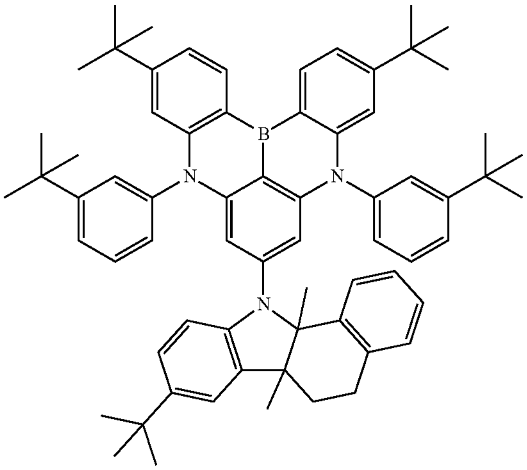
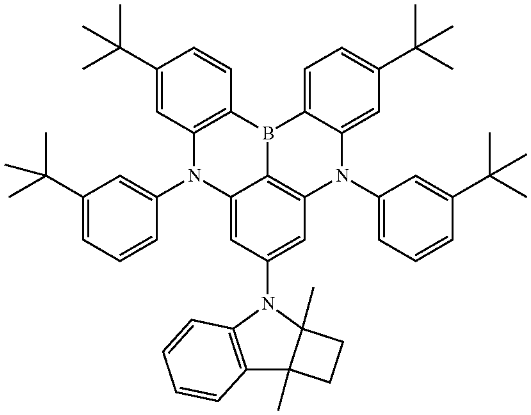
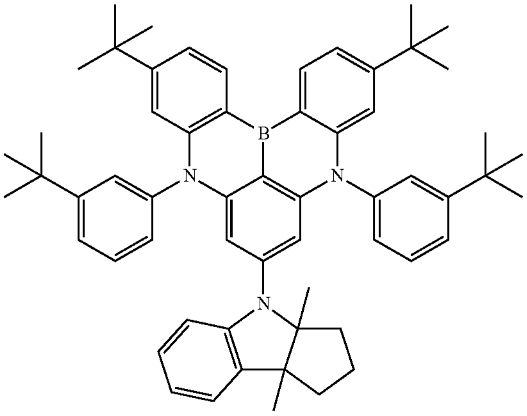
-continued
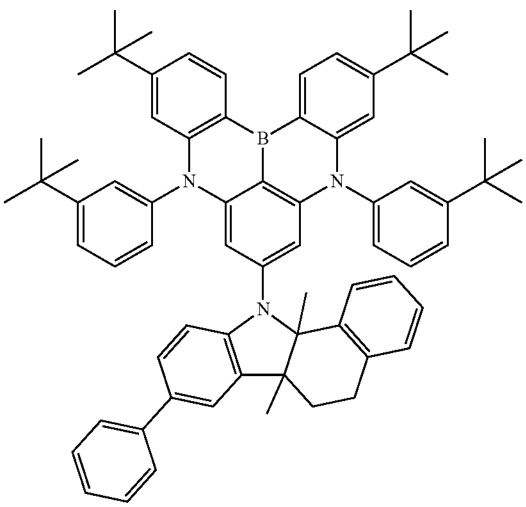
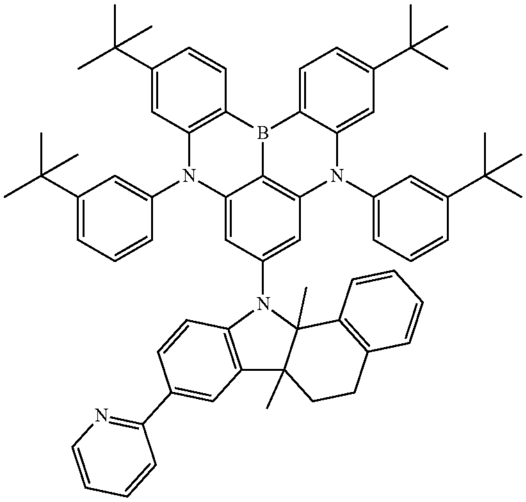
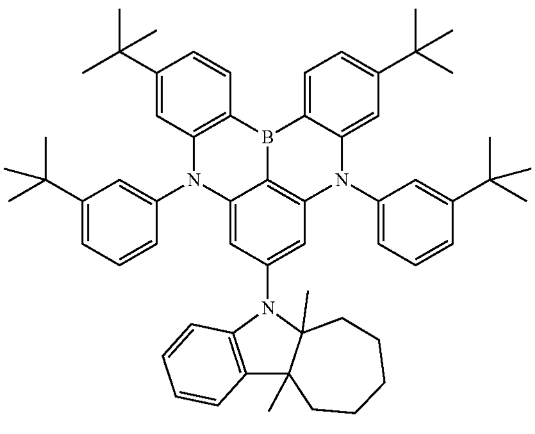

-continued
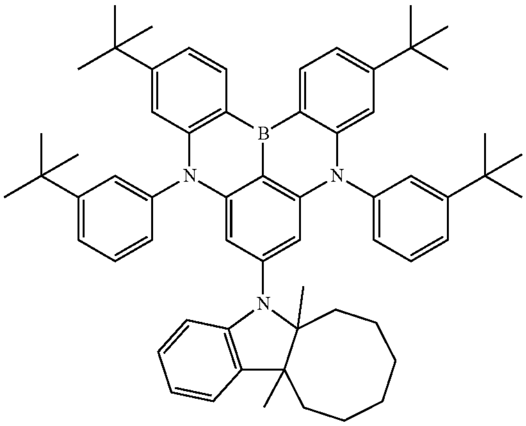
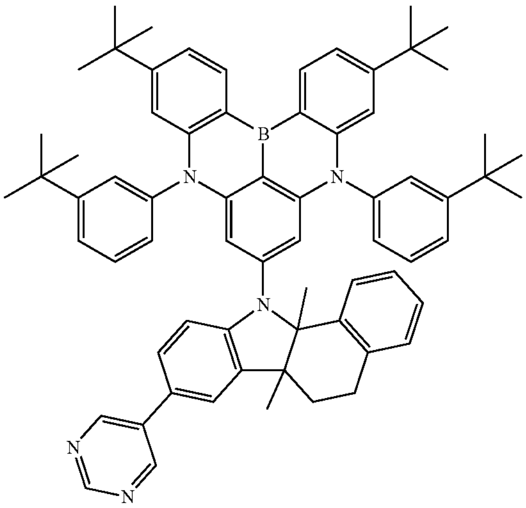
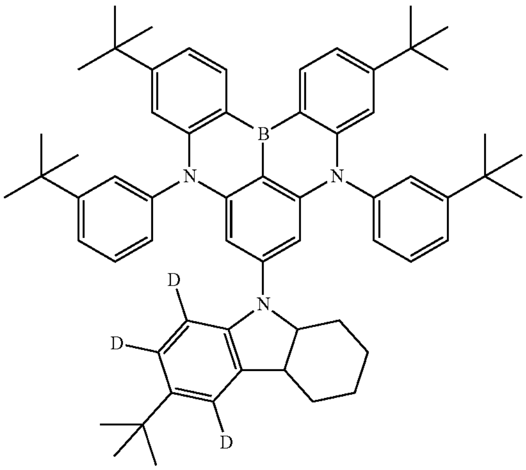
-continued
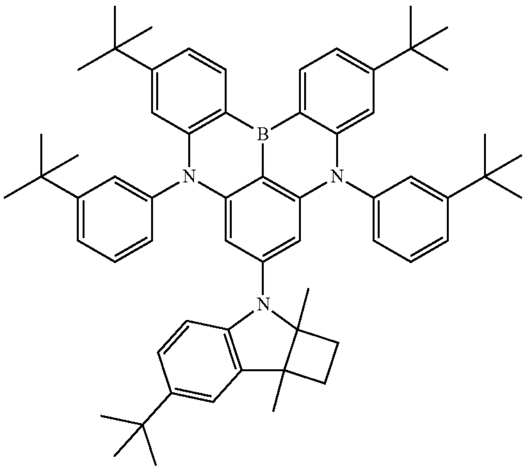
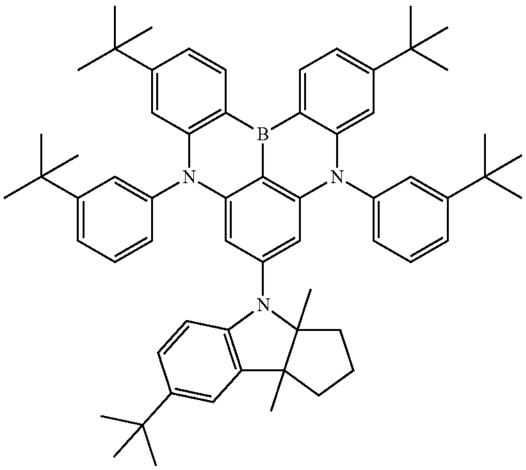
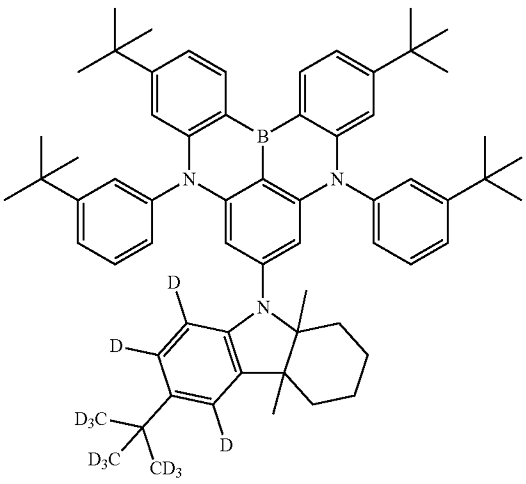

-continued
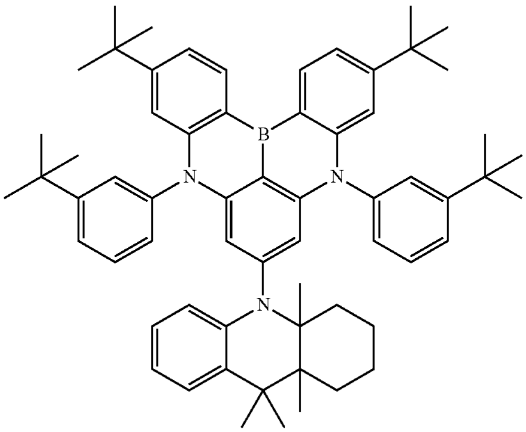
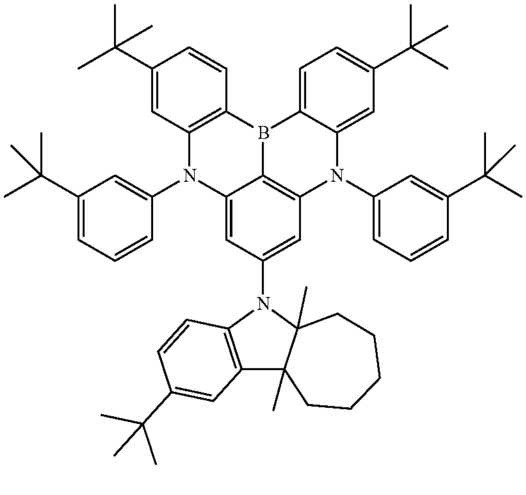
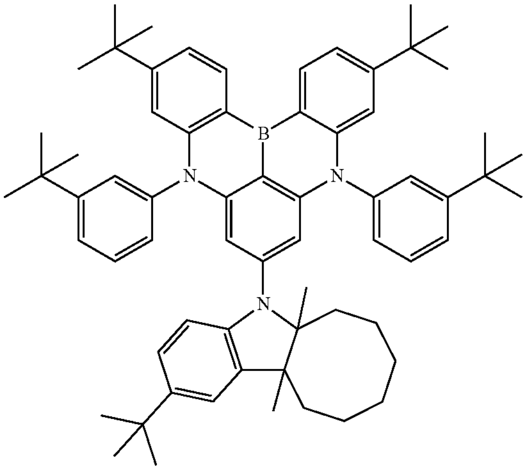
-continued
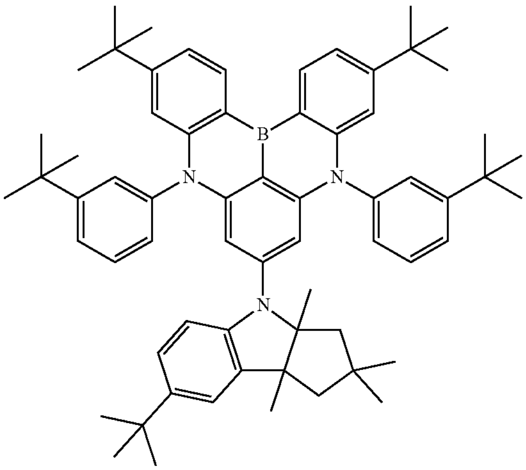
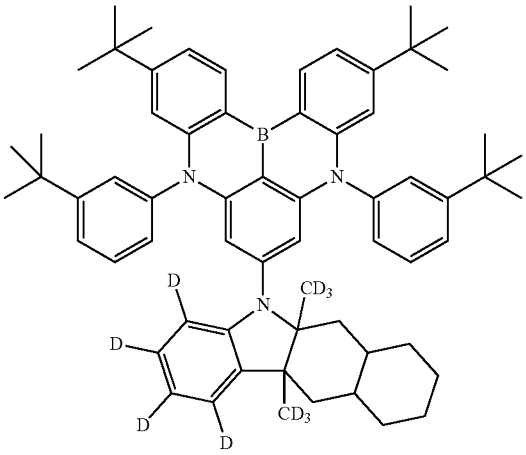
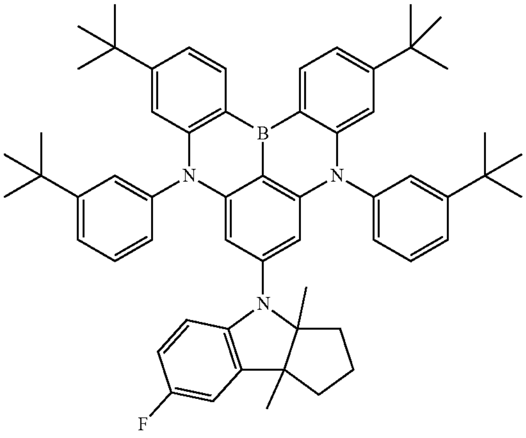

-continued
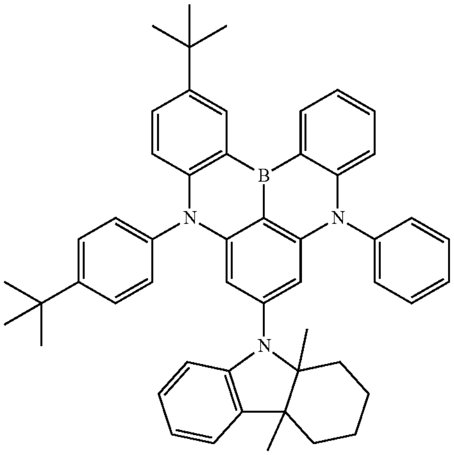
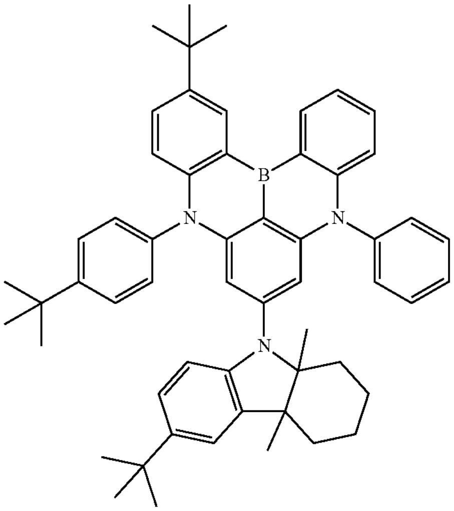
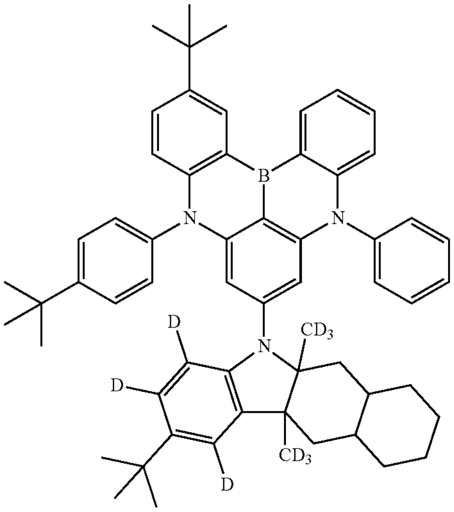
-continued
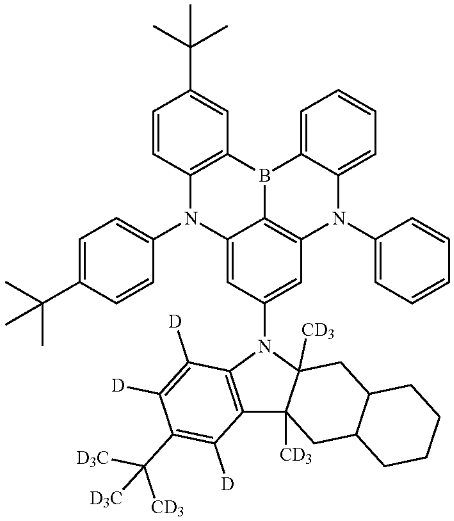
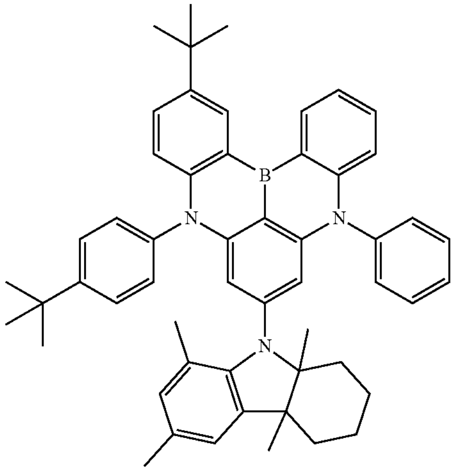
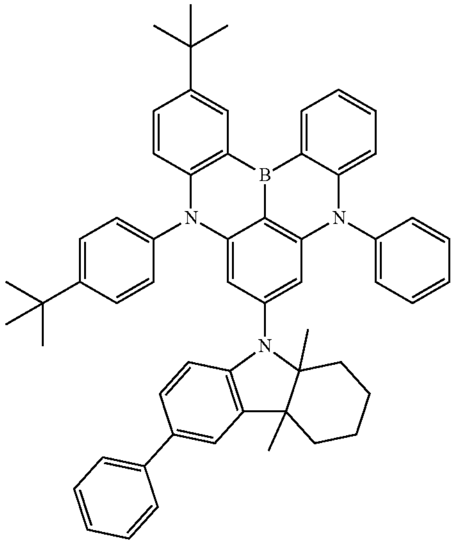

-continued
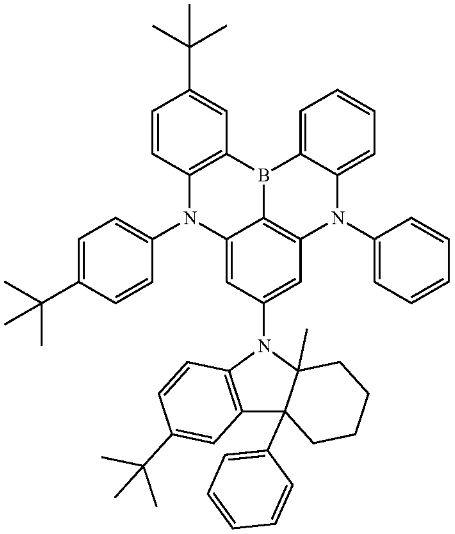
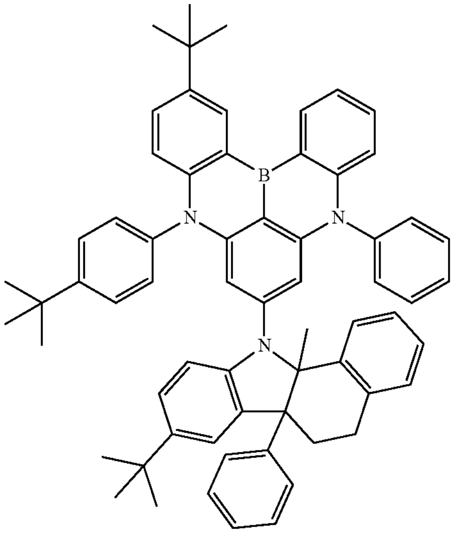
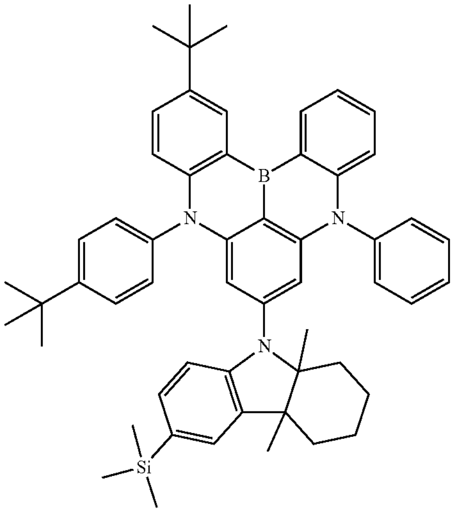
-continued
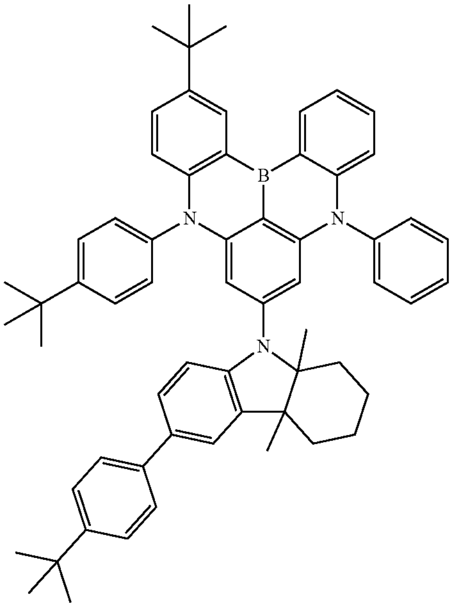
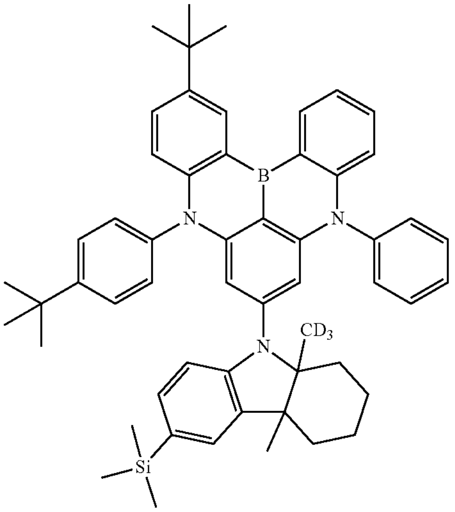
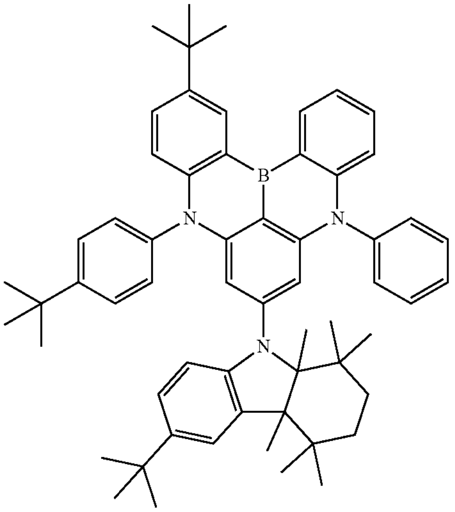

-continued
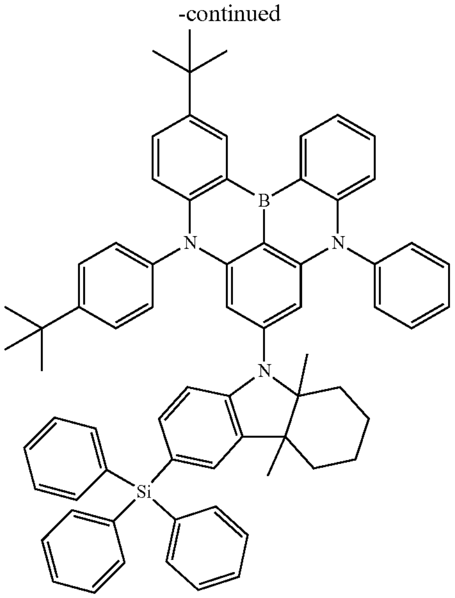
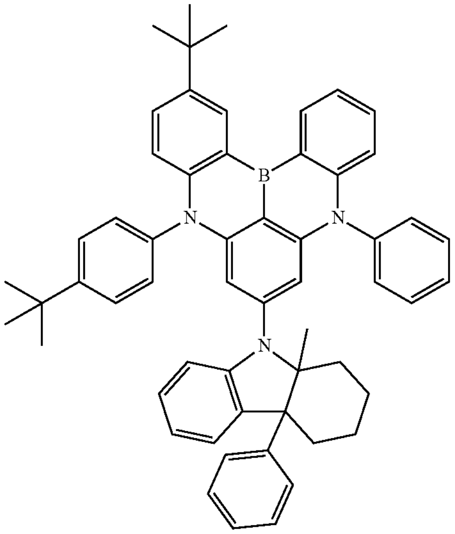
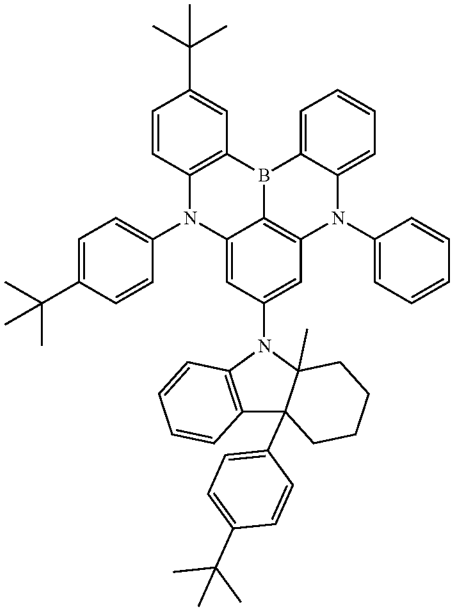
-continued
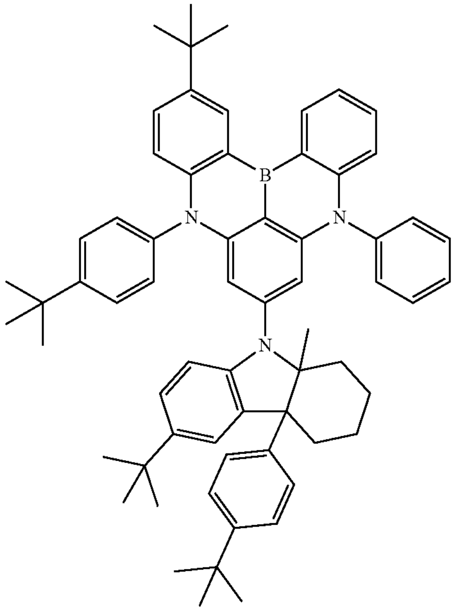
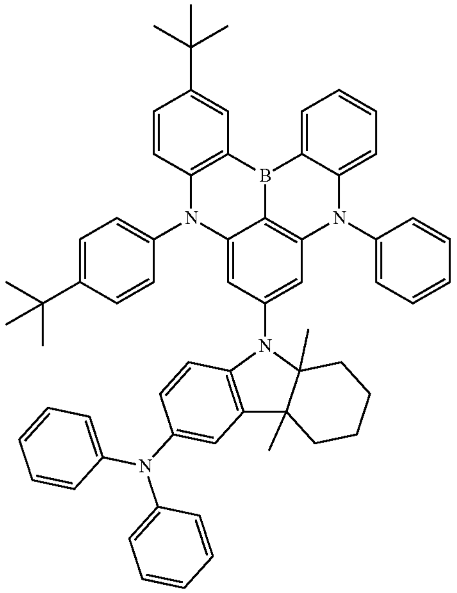

-continued
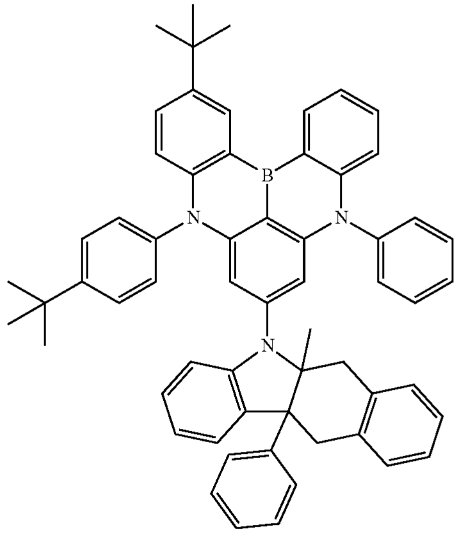
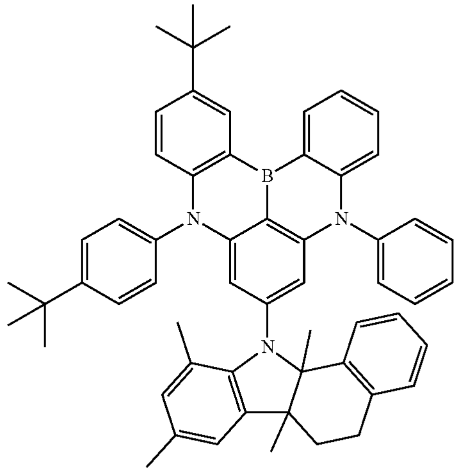
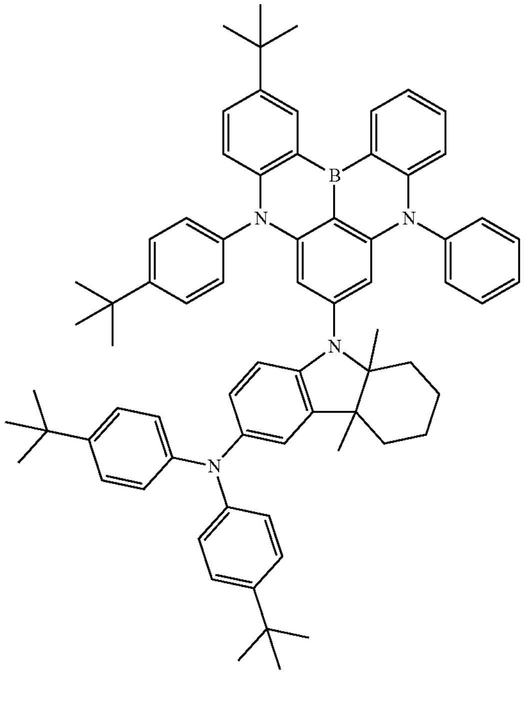
-continued
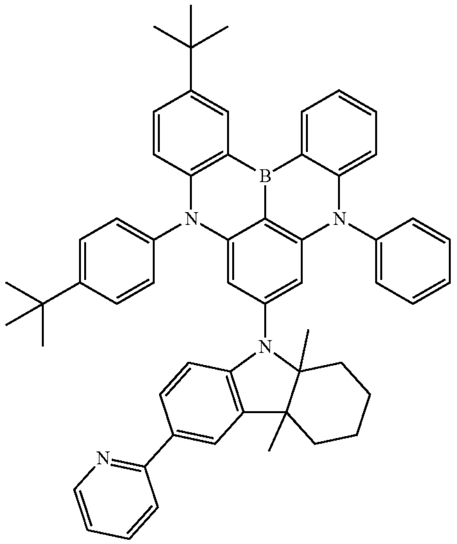
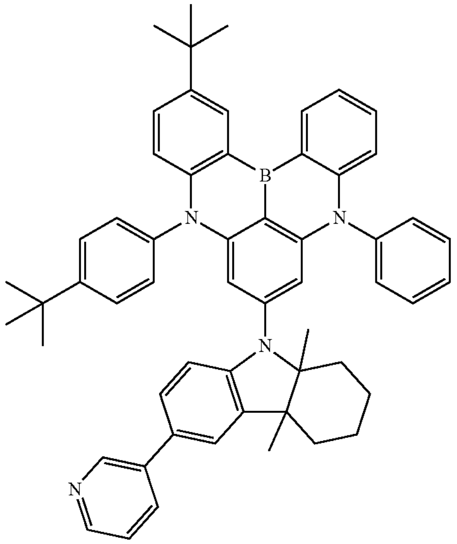
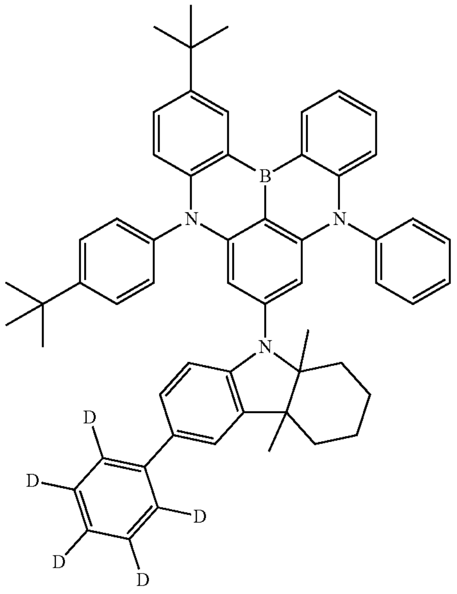

-continued
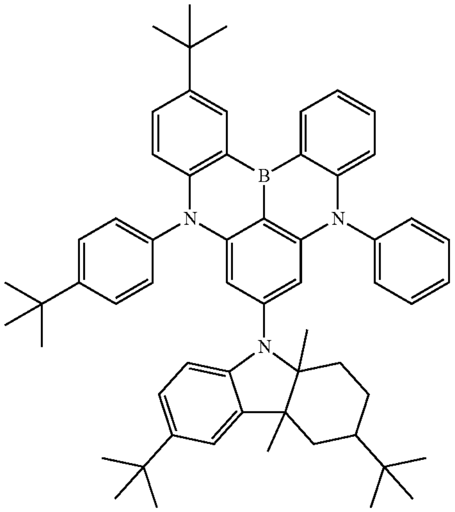
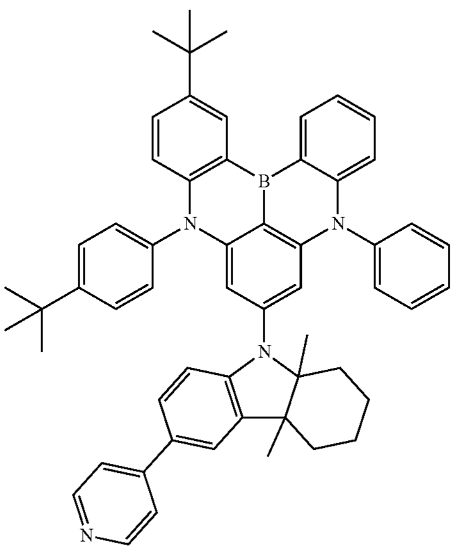
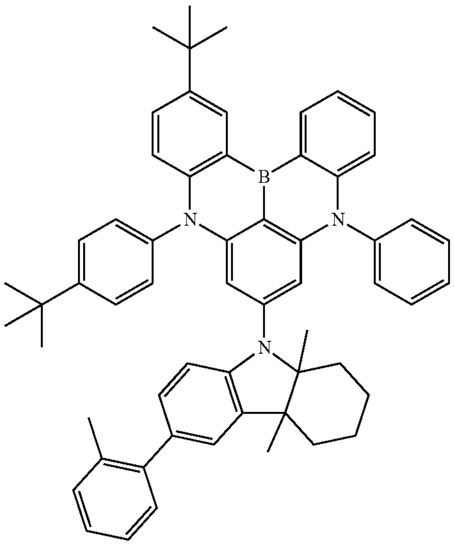
-continued
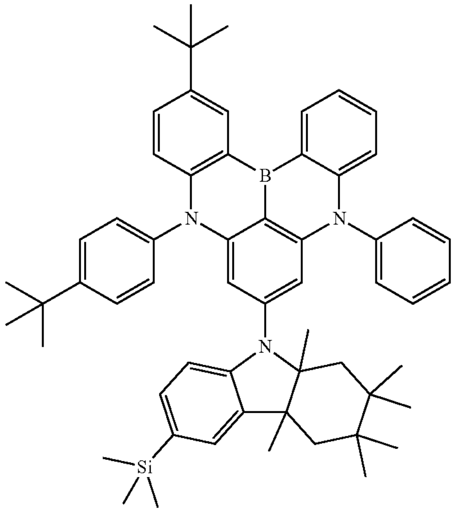
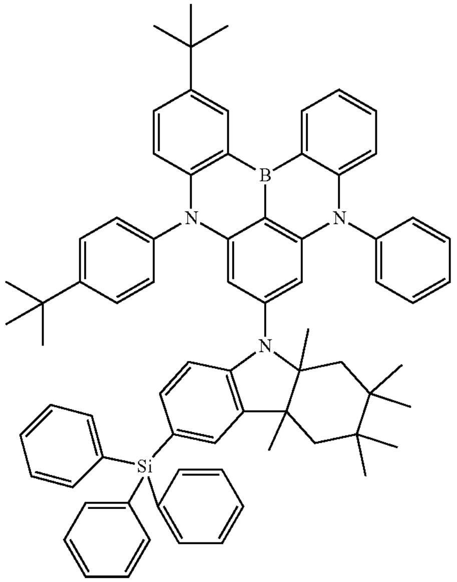
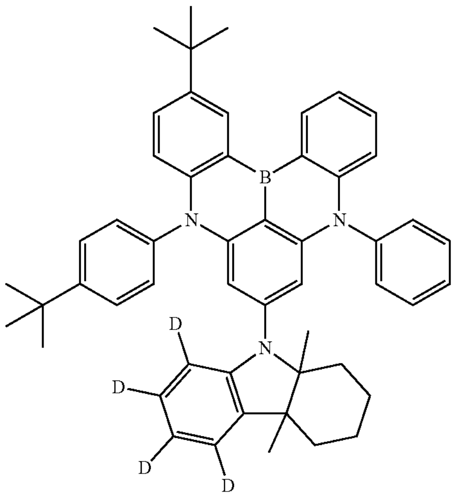

-continued
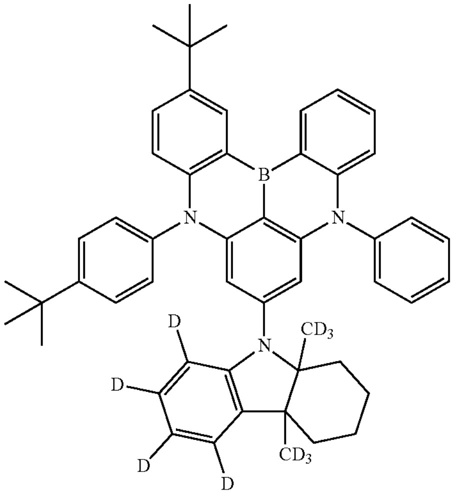
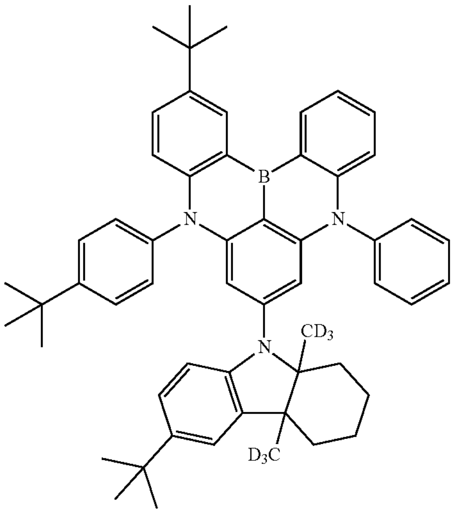
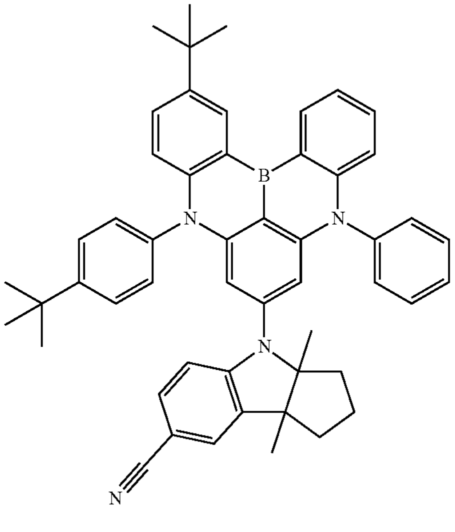
-continued
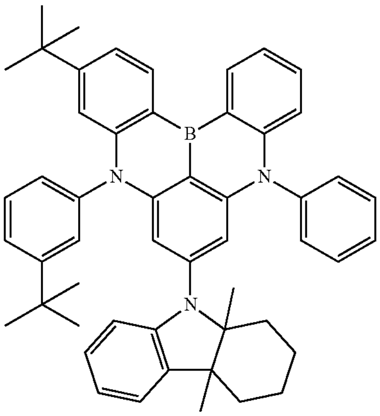
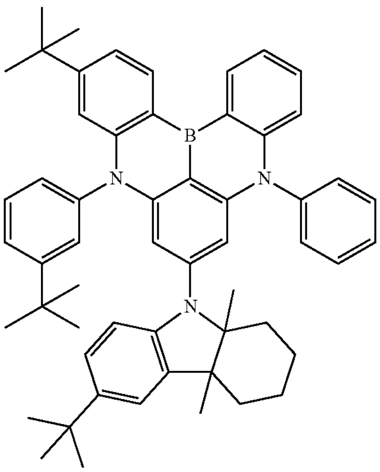
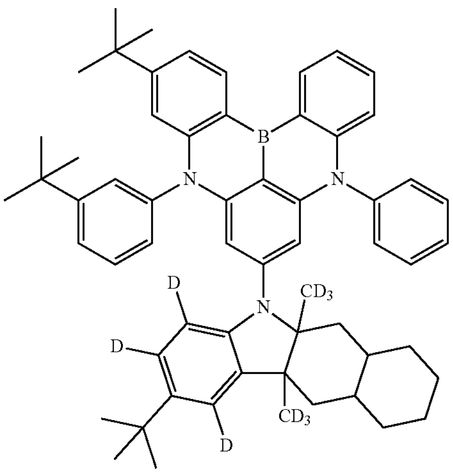

-continued
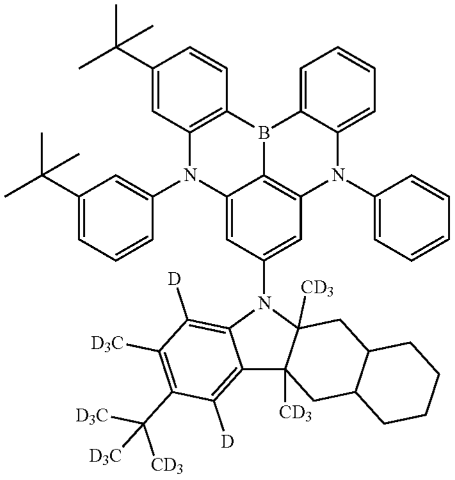
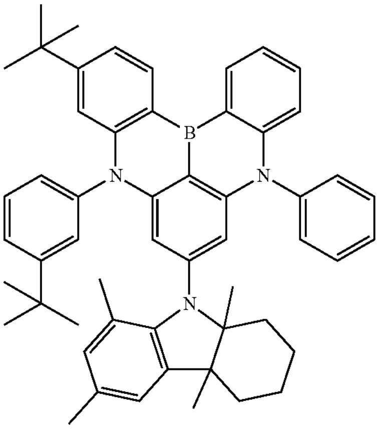
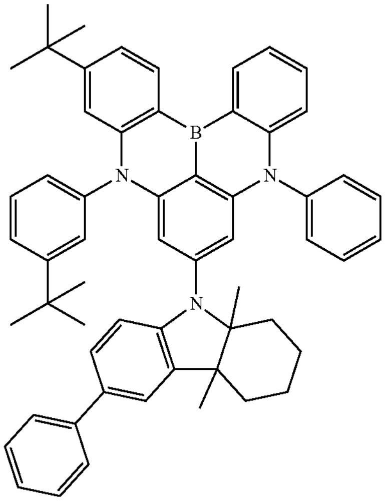
-continued
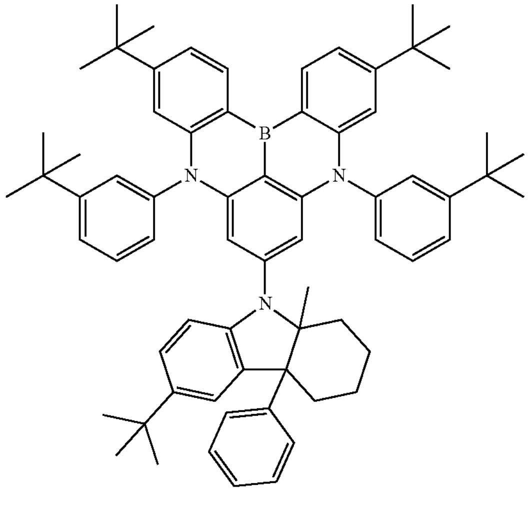
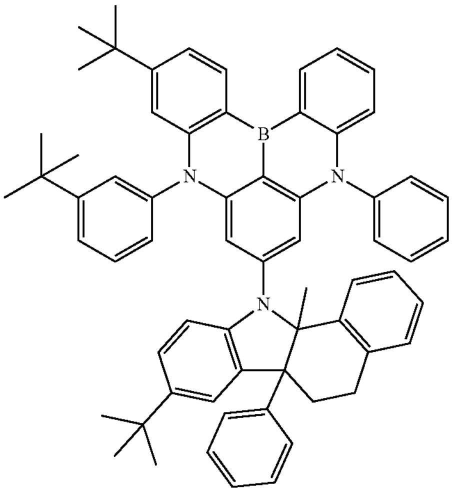
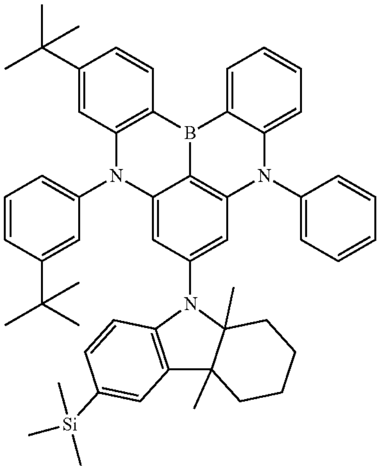

-continued
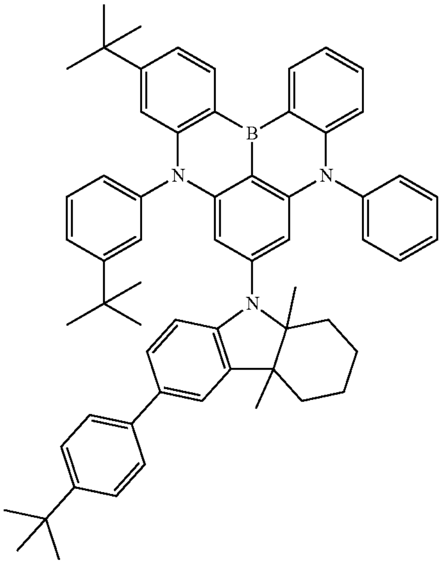
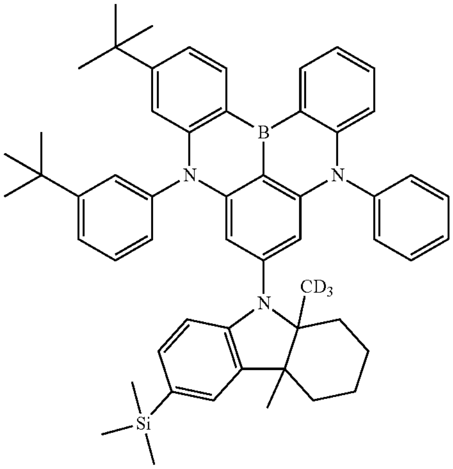
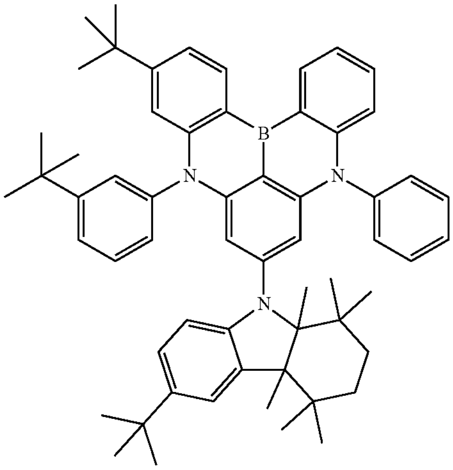
-continued
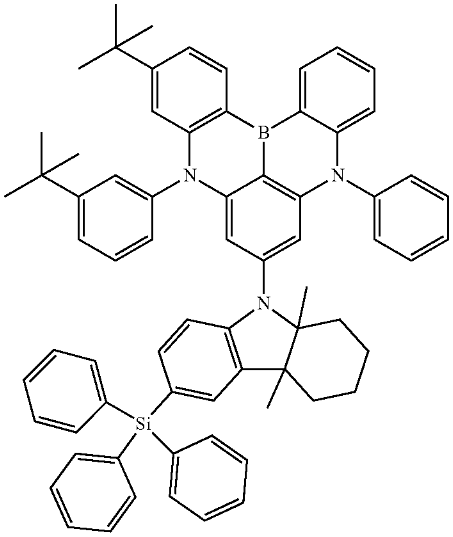
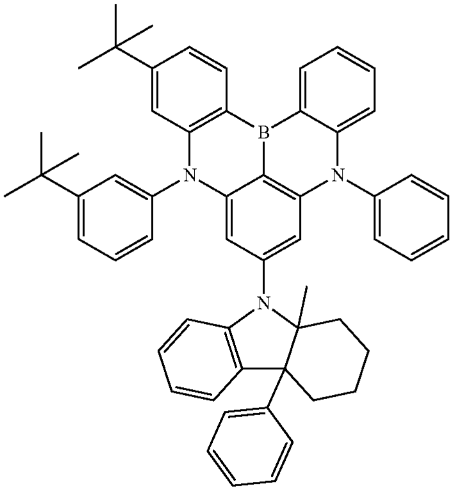
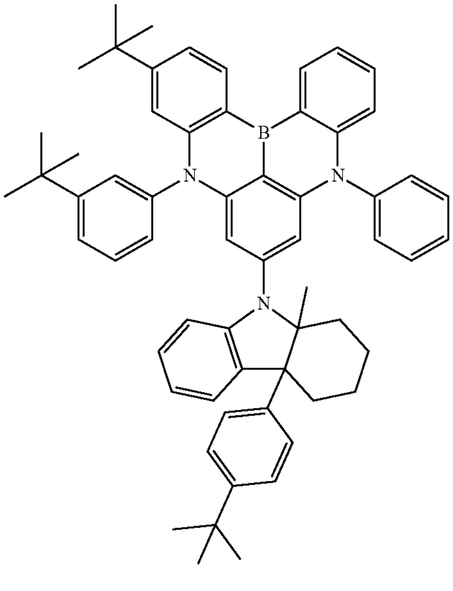

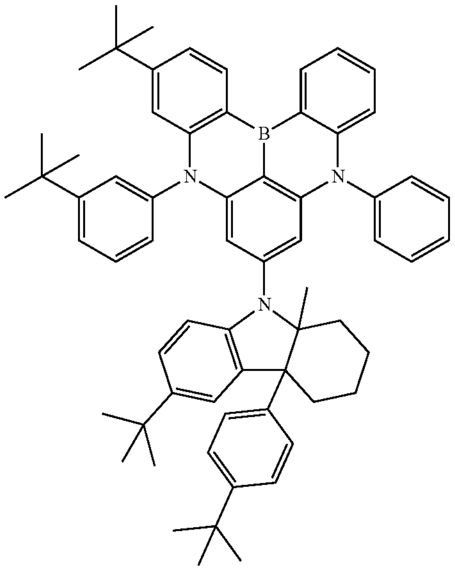
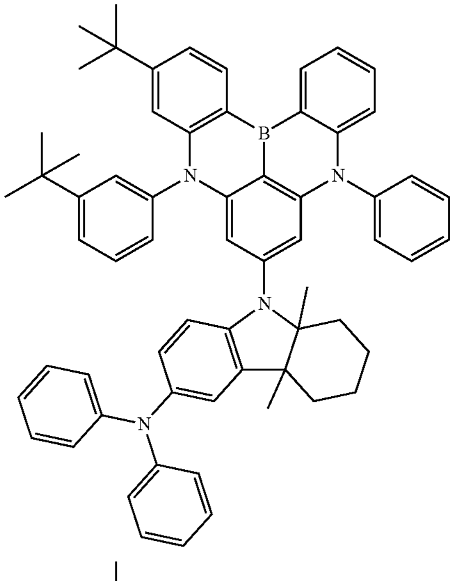
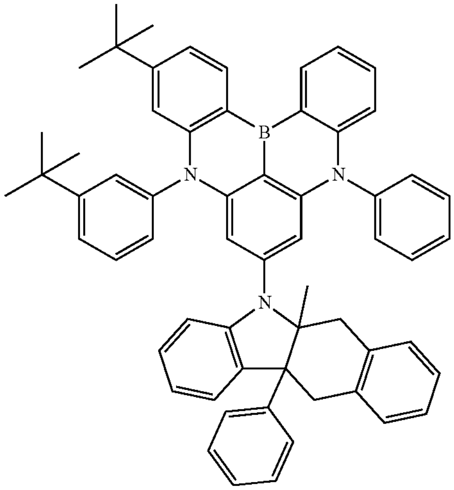
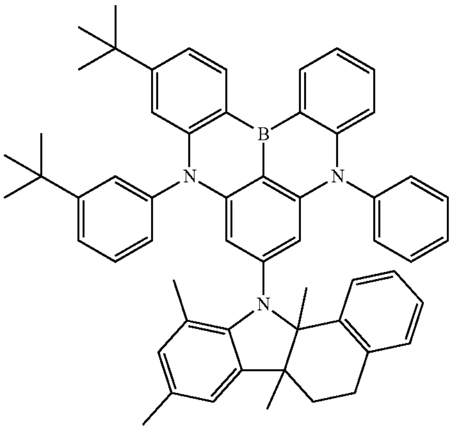
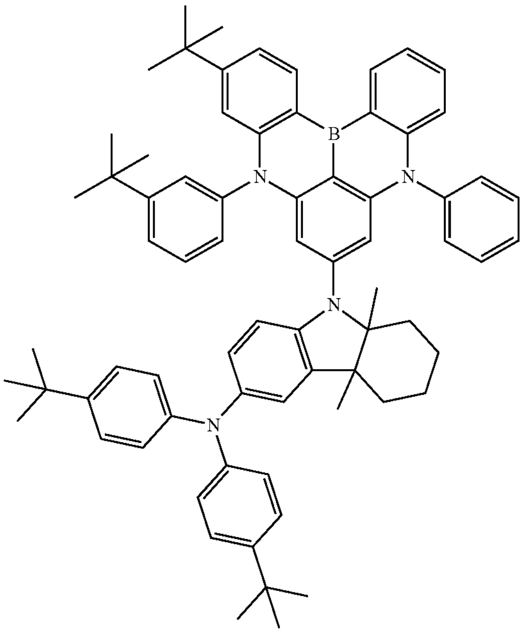
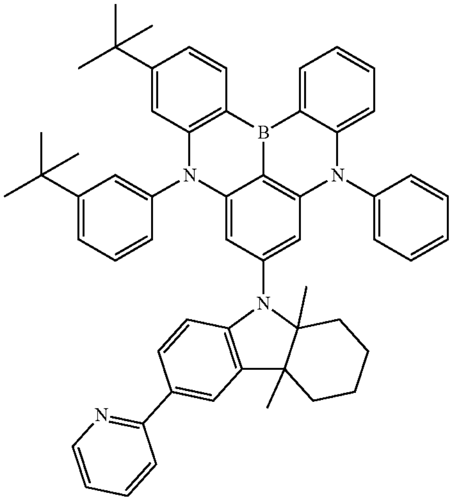

-continued
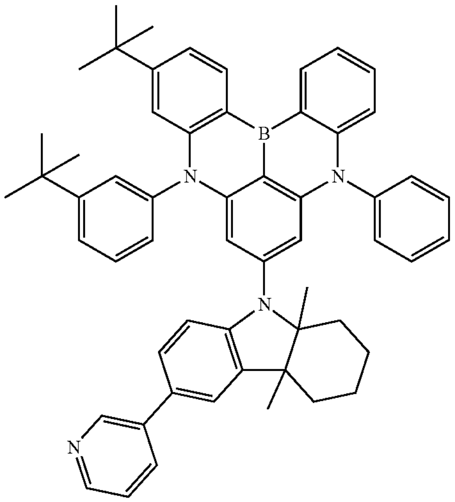
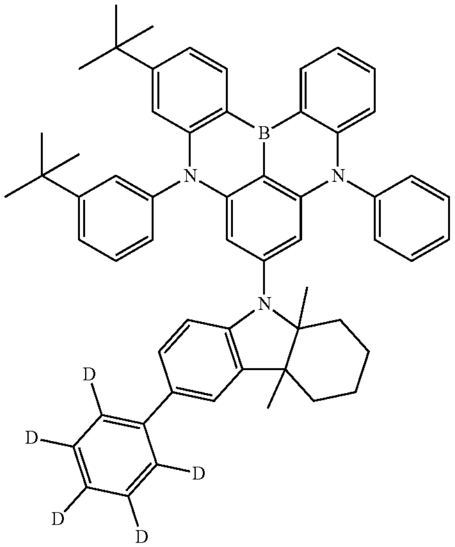
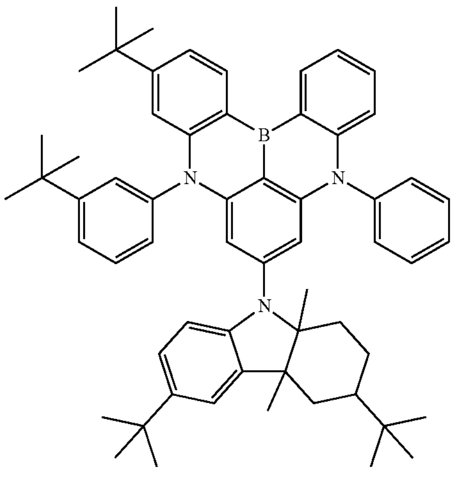
-continued
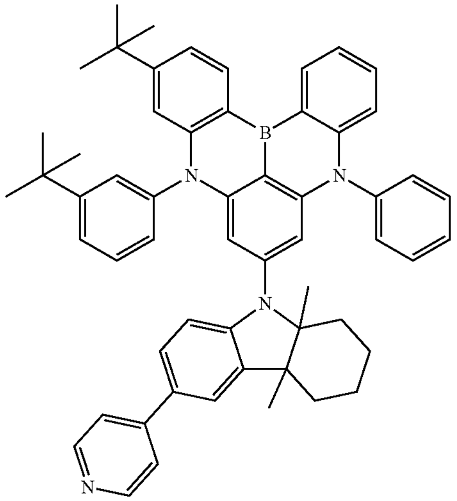
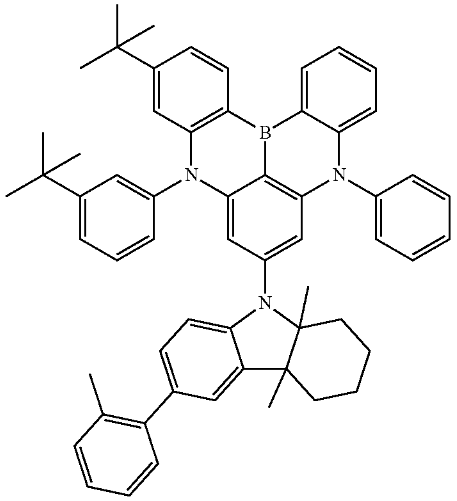
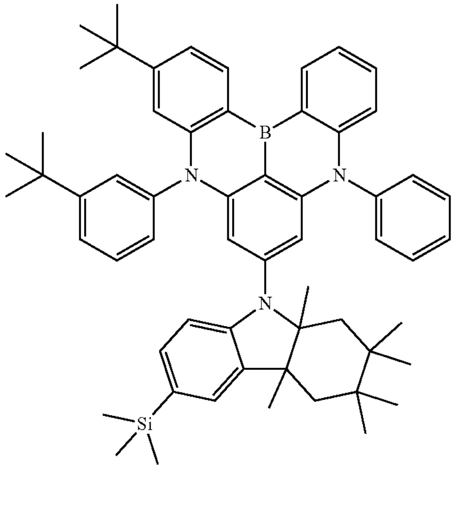

-continued
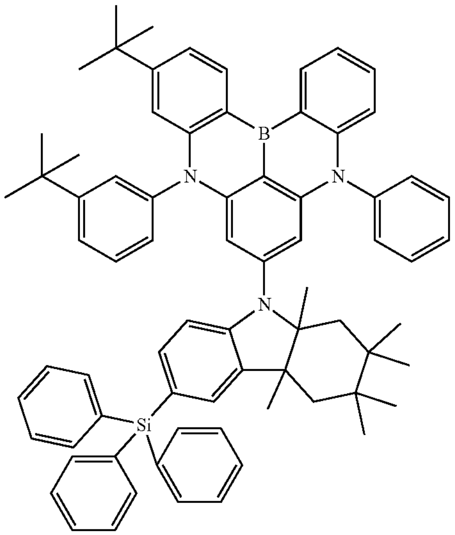
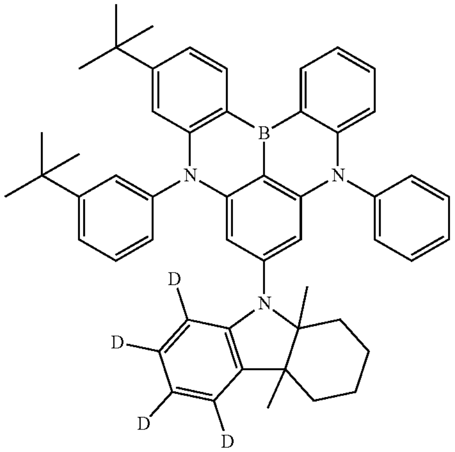
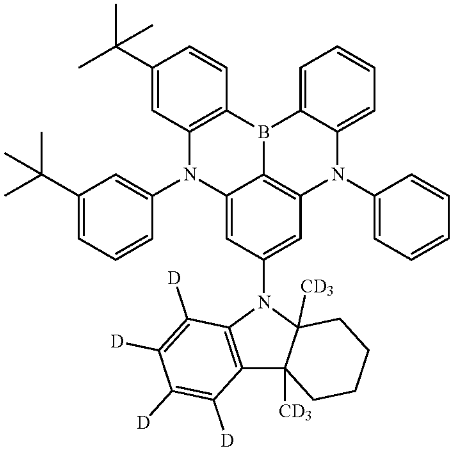
-continued
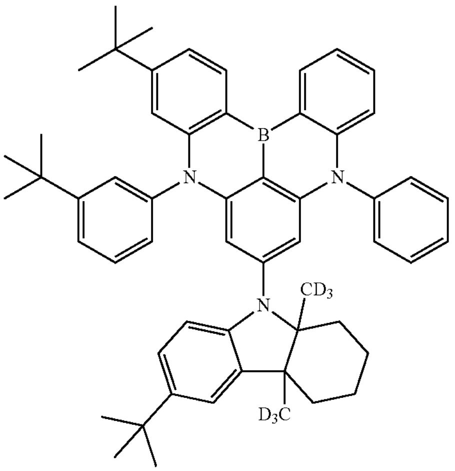
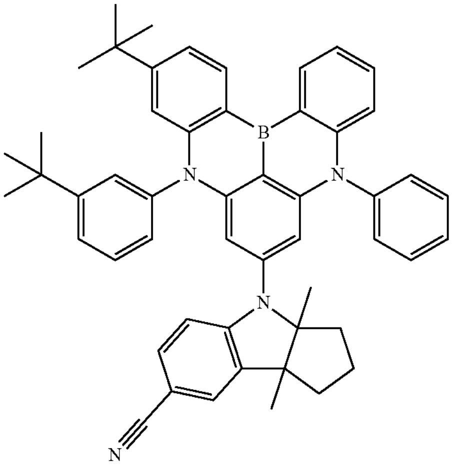
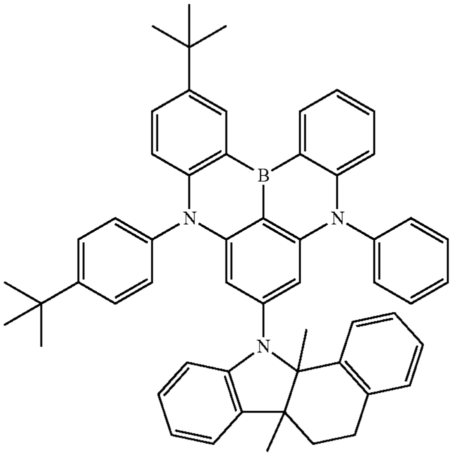

-continued
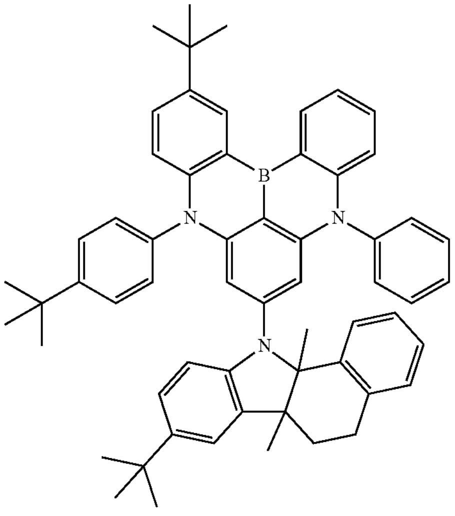
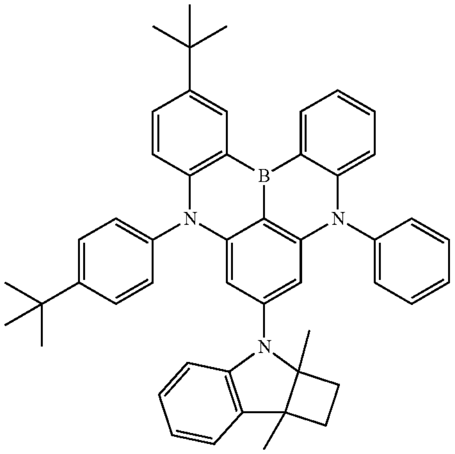
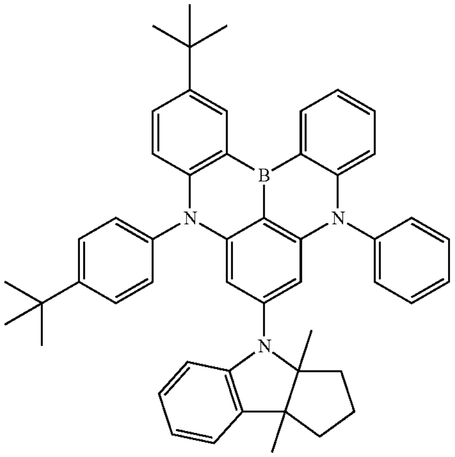
-continued
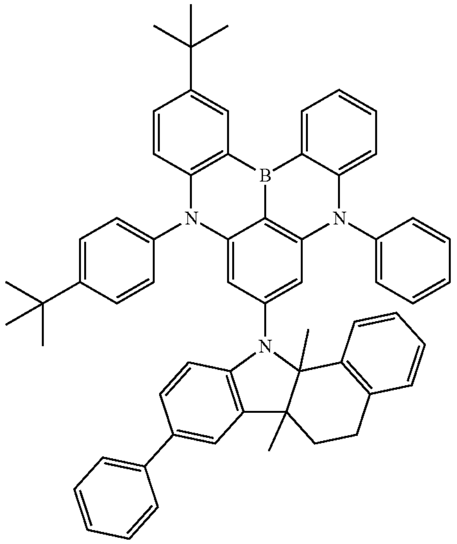
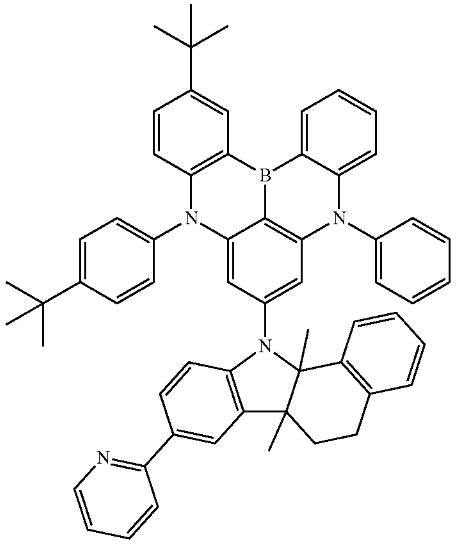
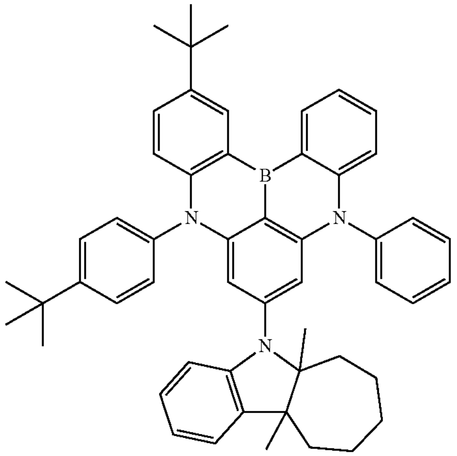

-continued
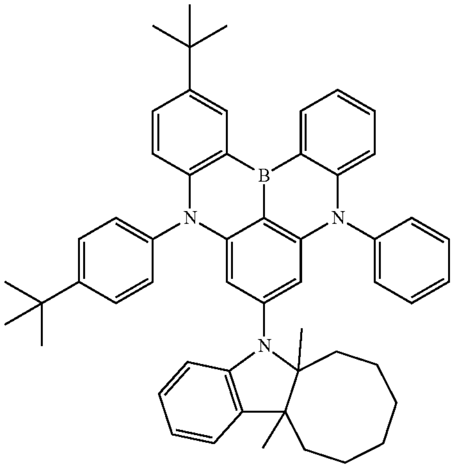
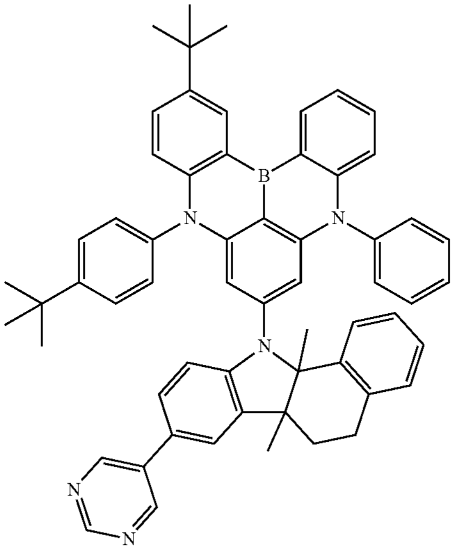
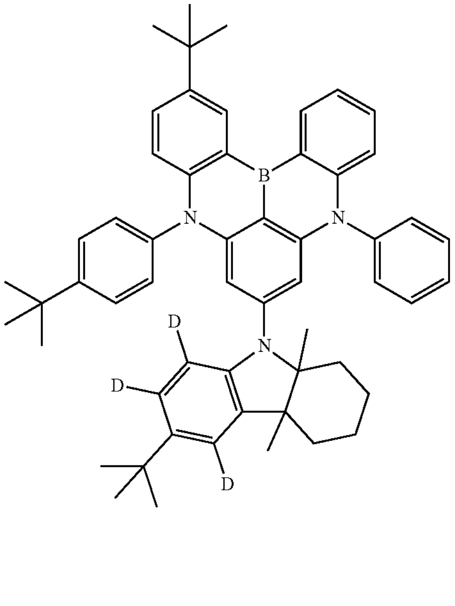
-continued
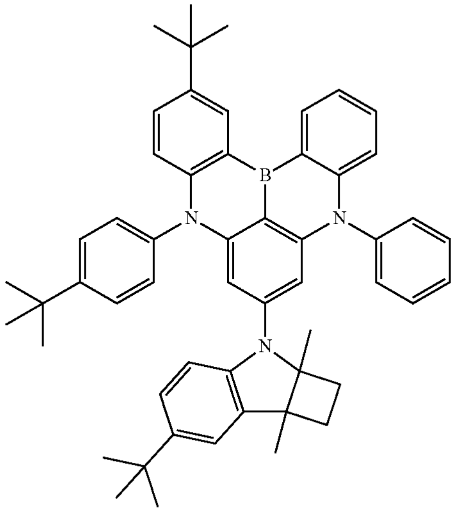
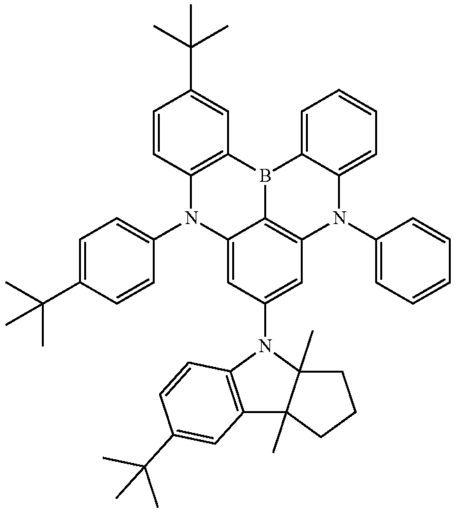
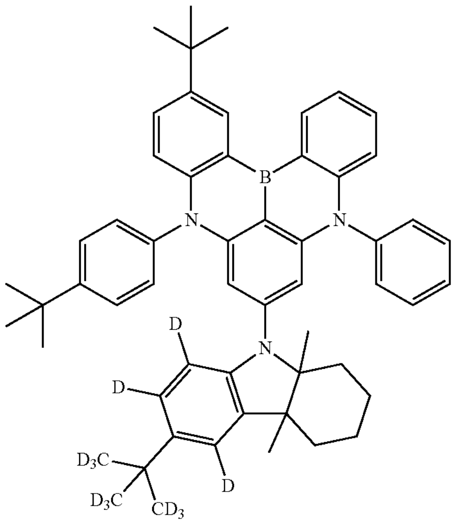

-continued
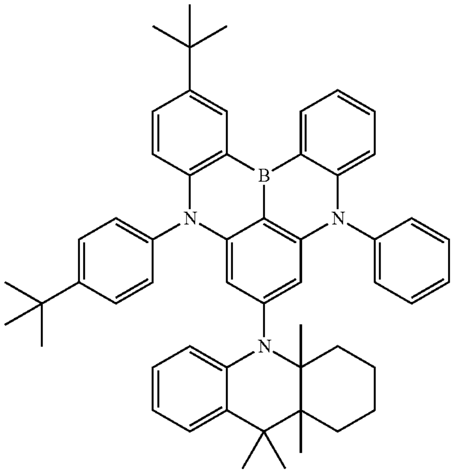
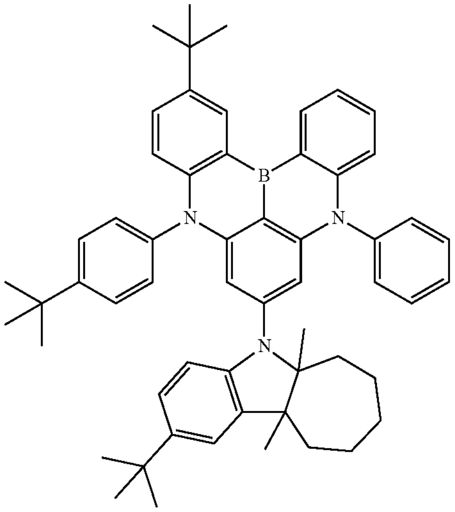
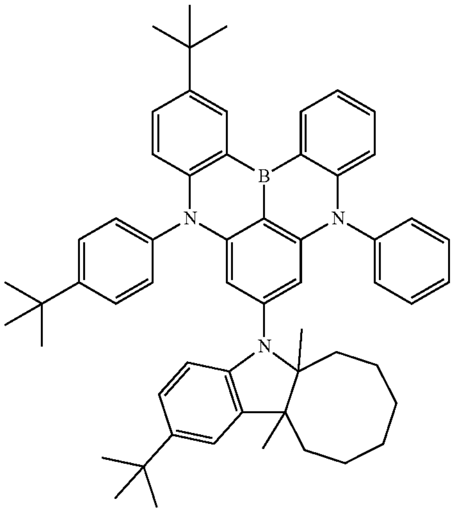
-continued
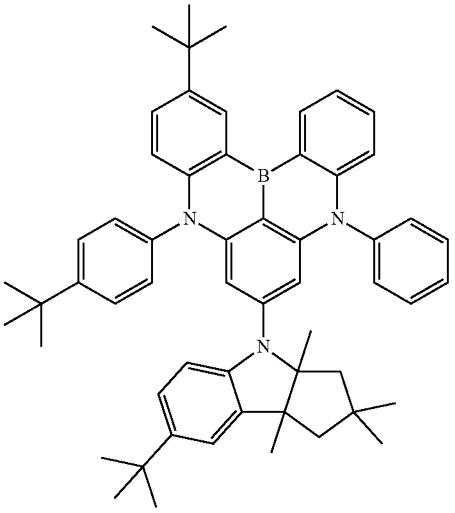
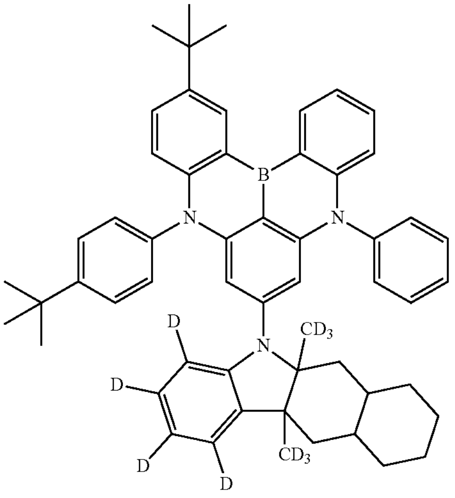
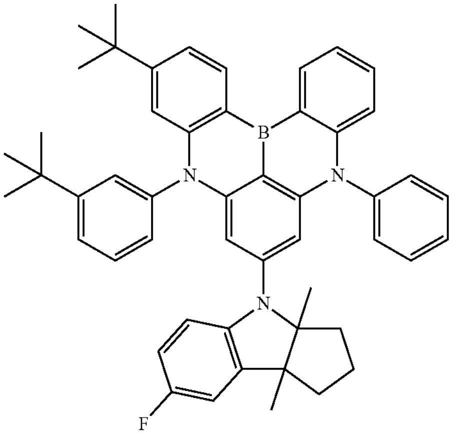

-continued
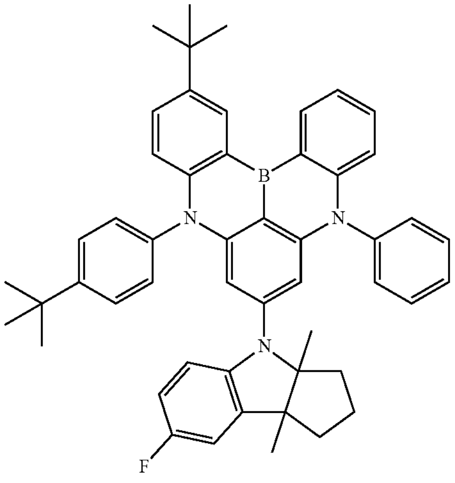
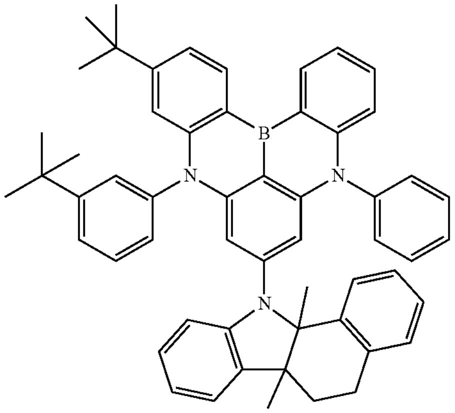
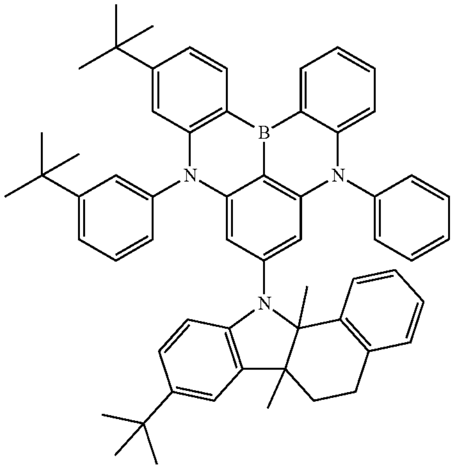
-continued
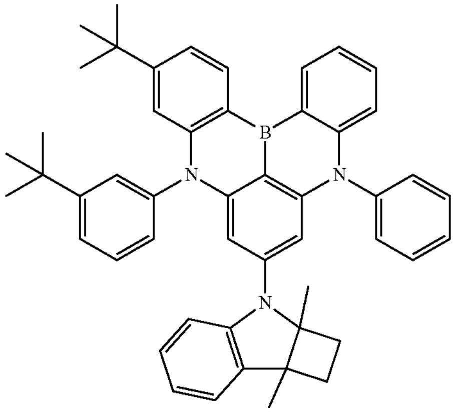
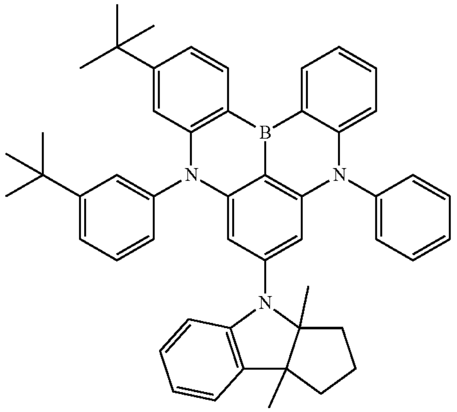
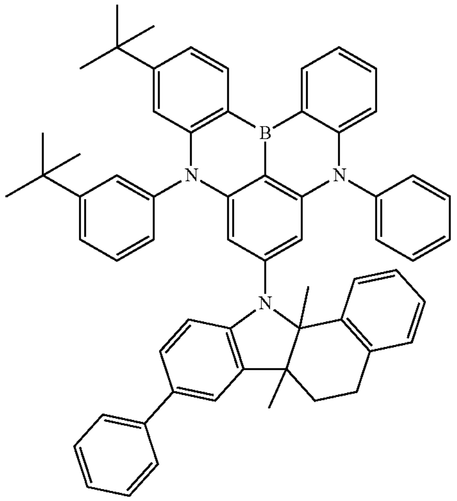

-continued
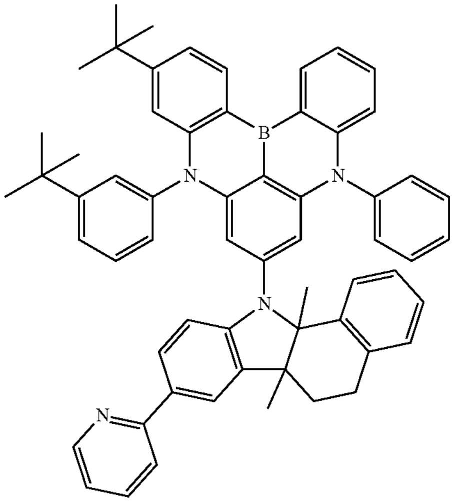
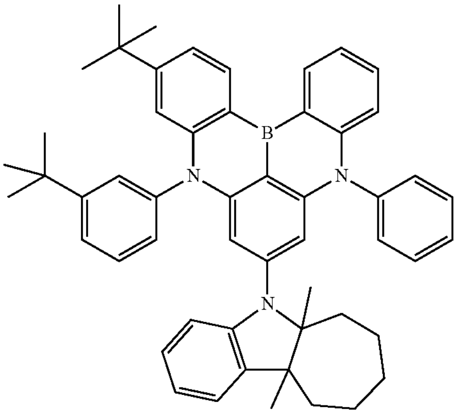
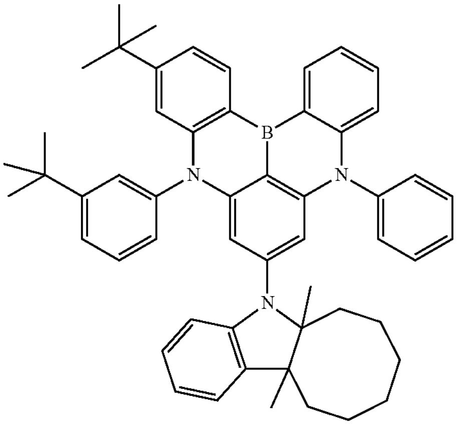
-continued
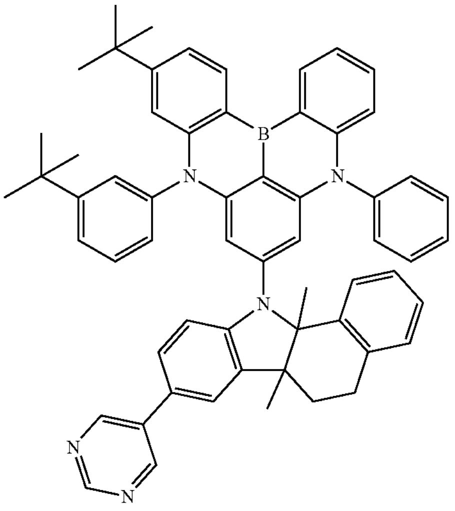
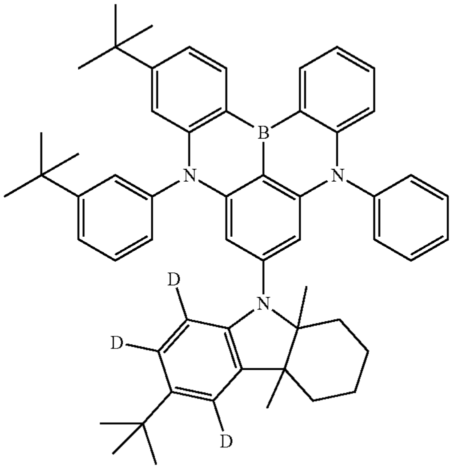
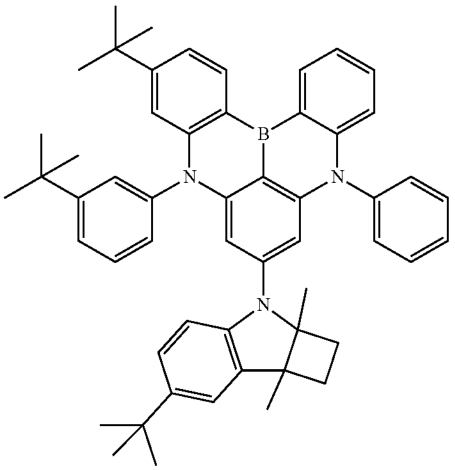

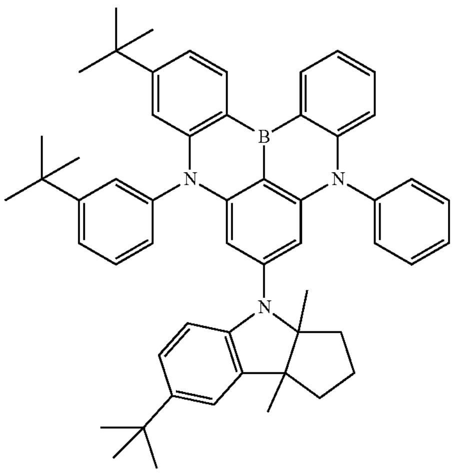
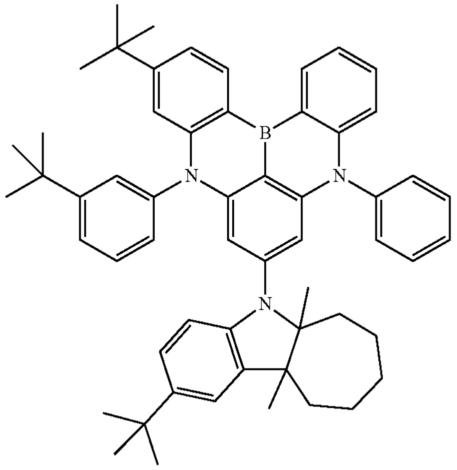
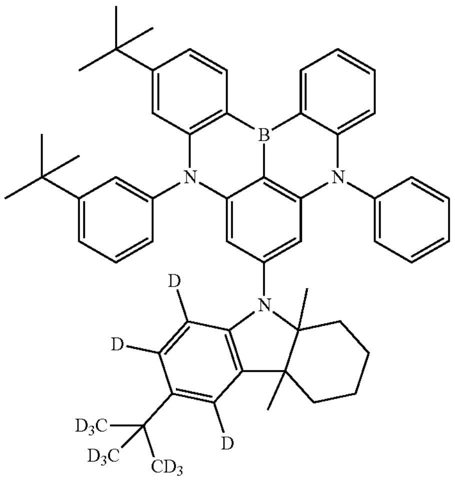
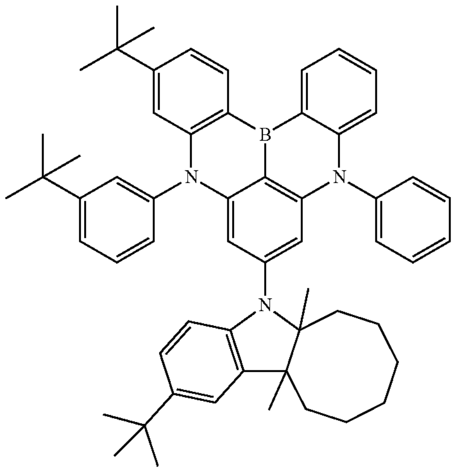
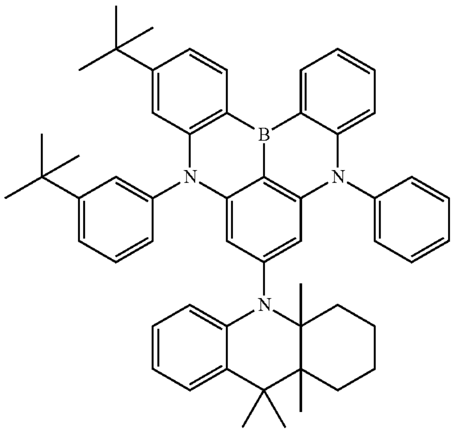
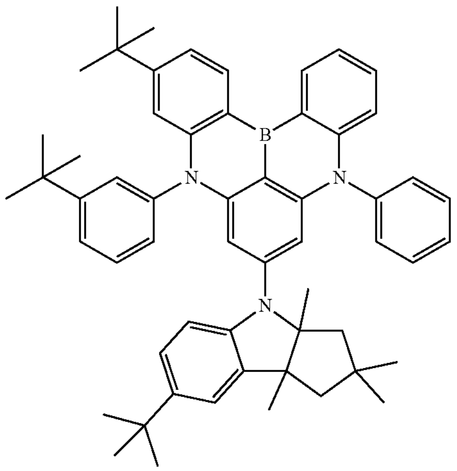

-continued
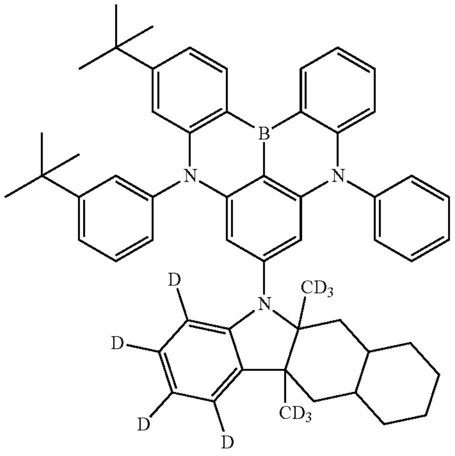
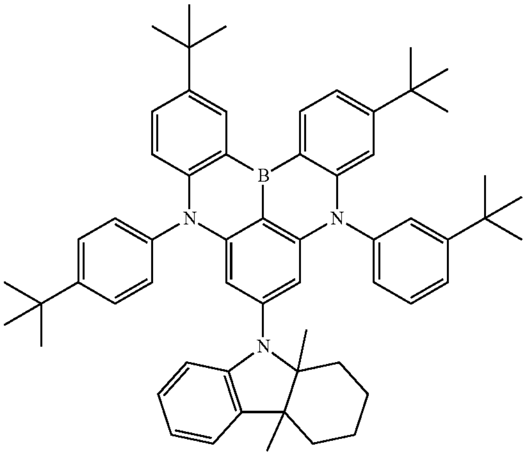
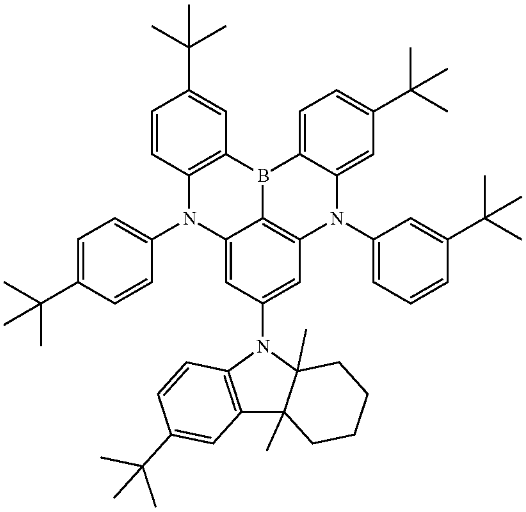
-continued
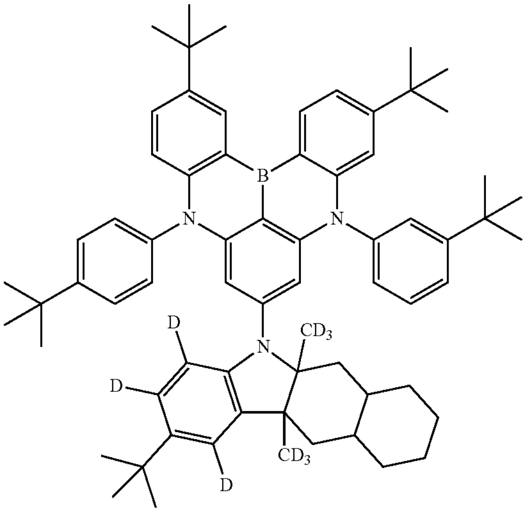
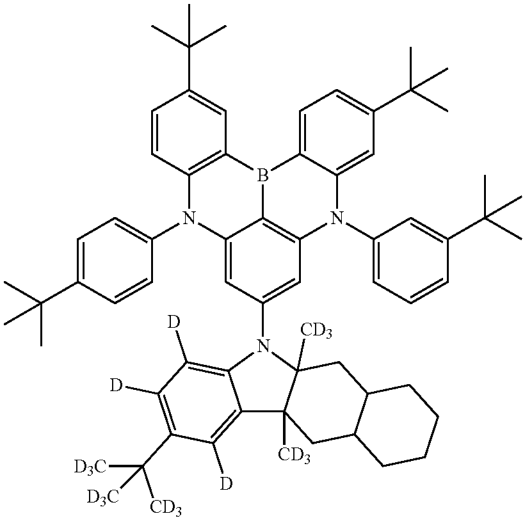
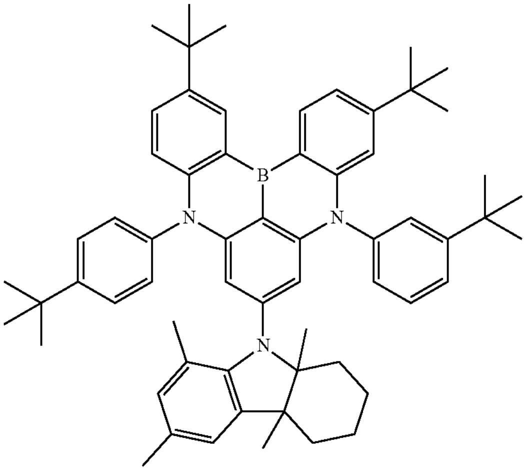

-continued
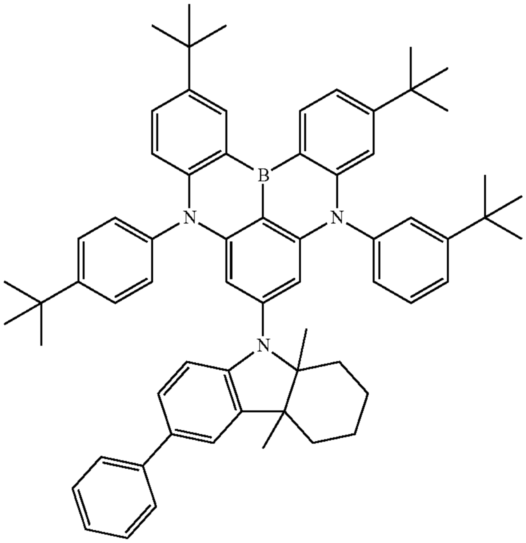
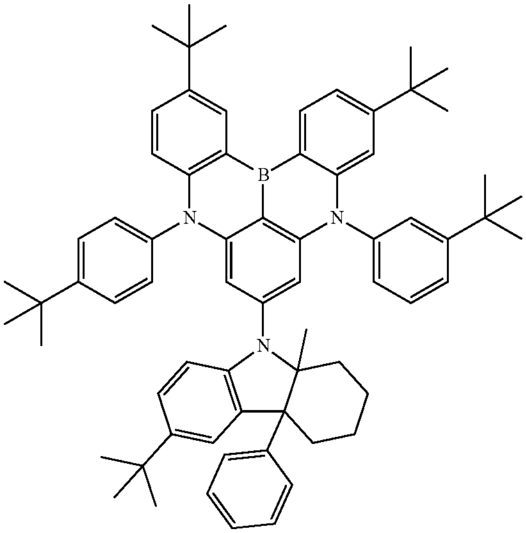
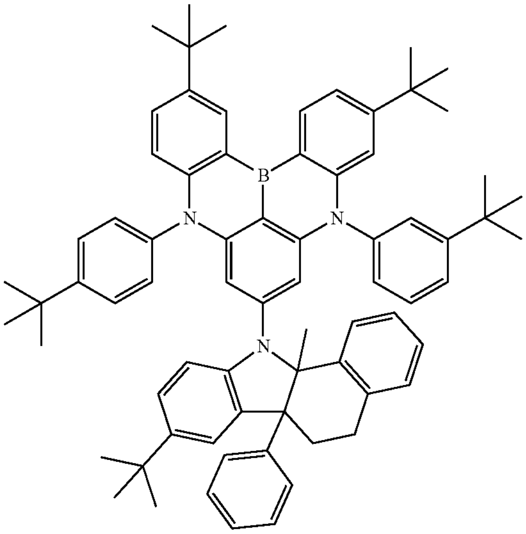
-continued
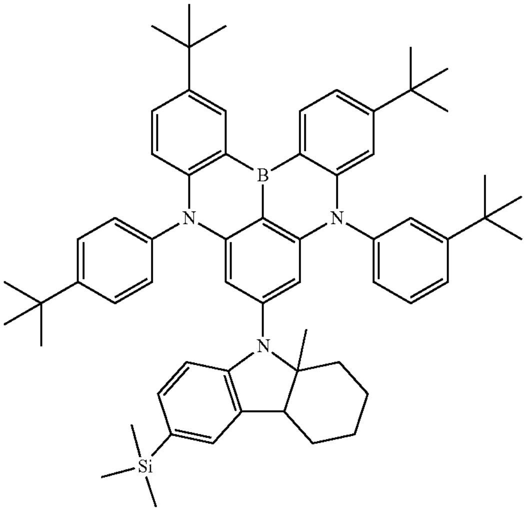
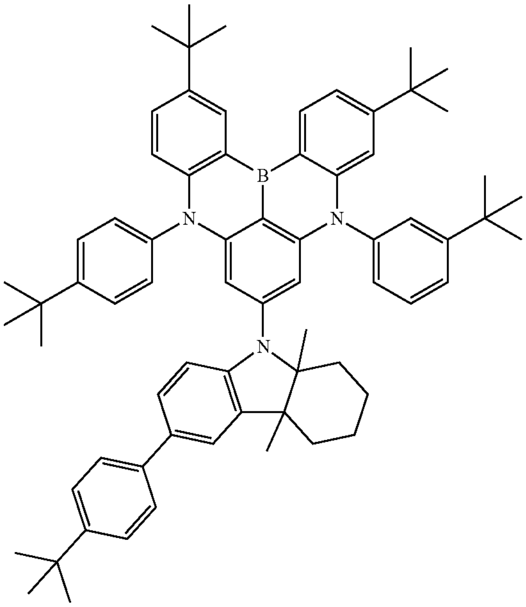
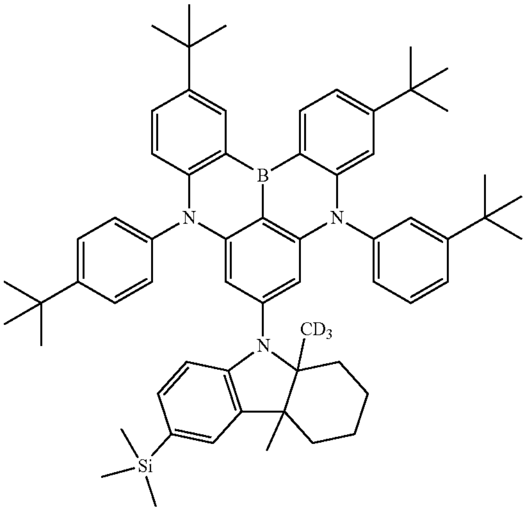

-continued
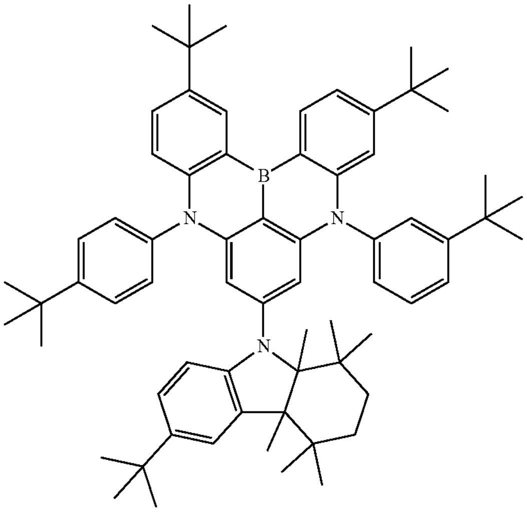
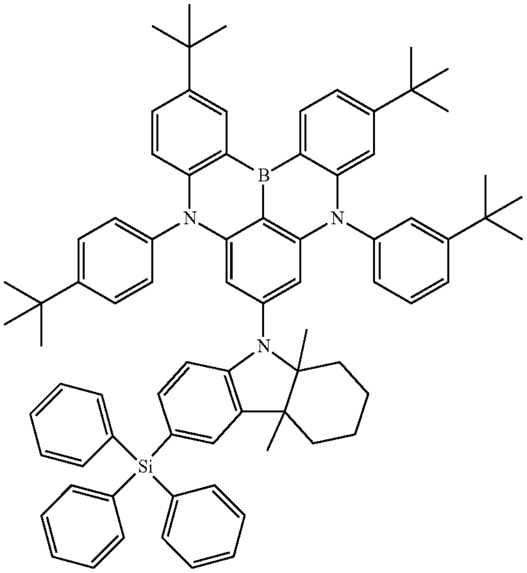
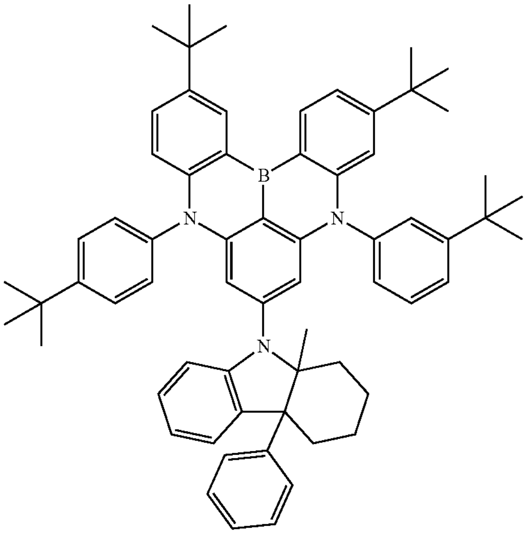
-continued
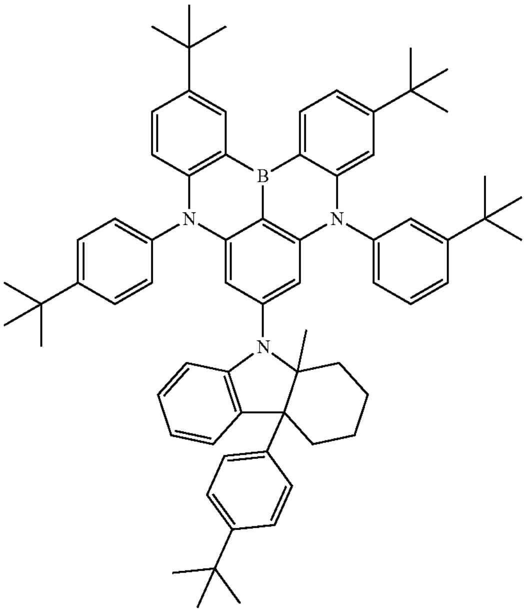
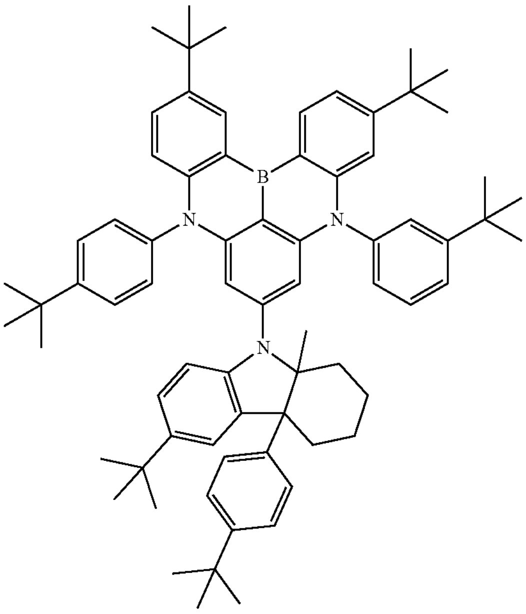

-continued
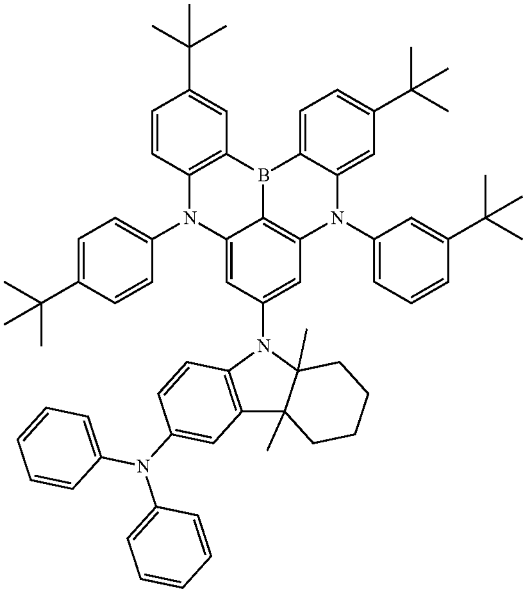
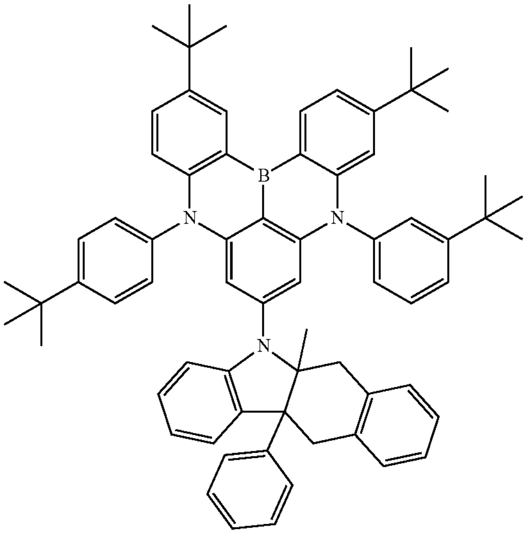
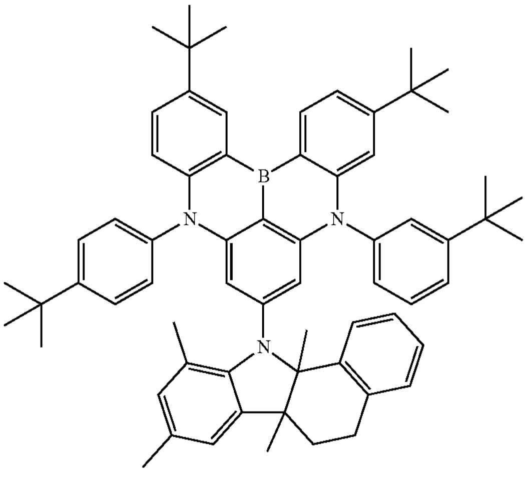
-continued
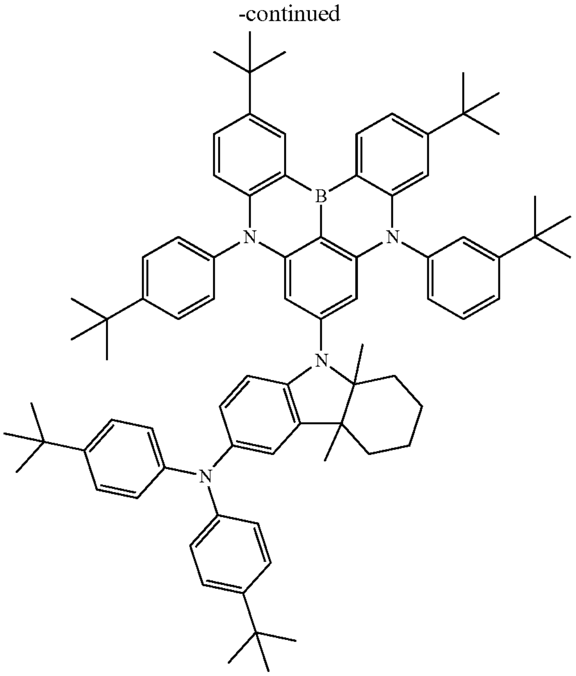
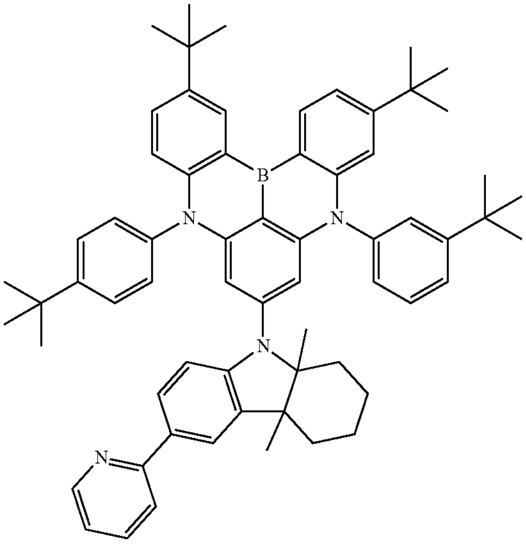

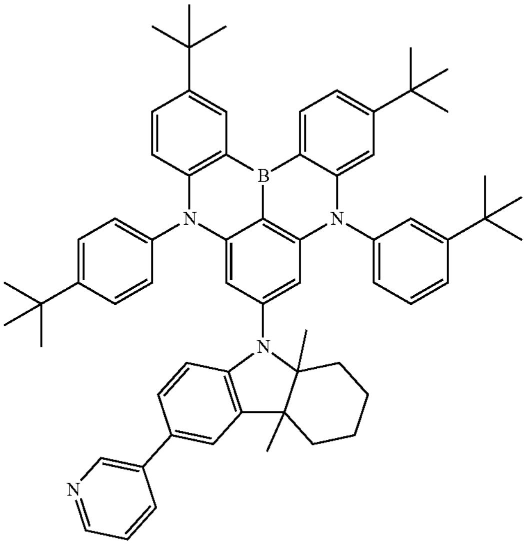
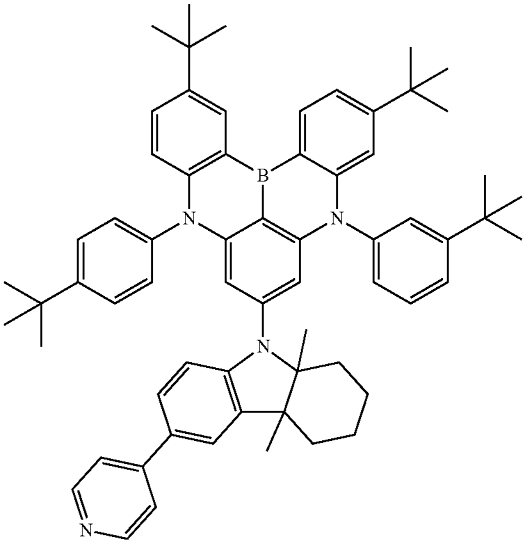
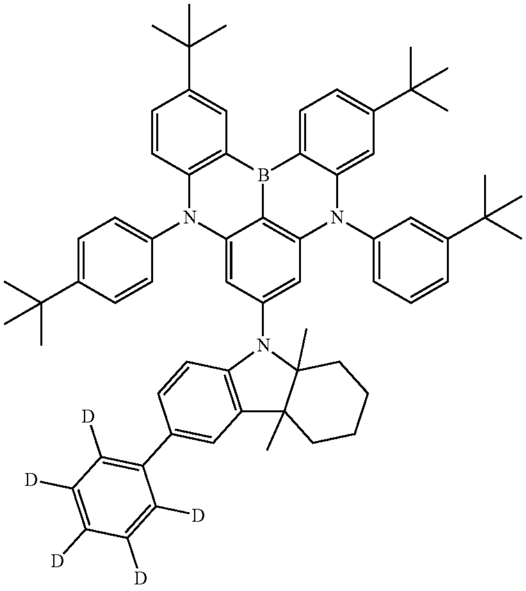
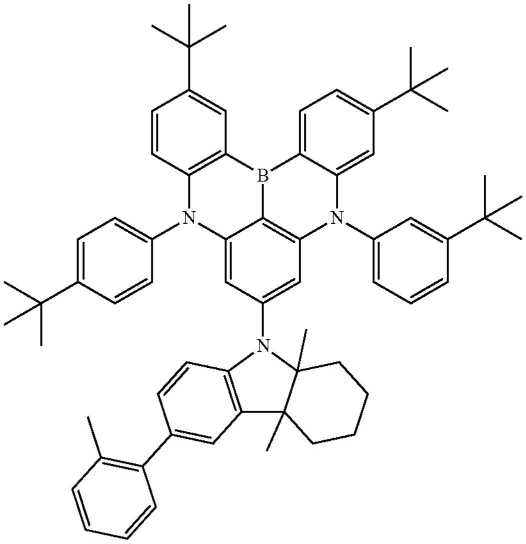
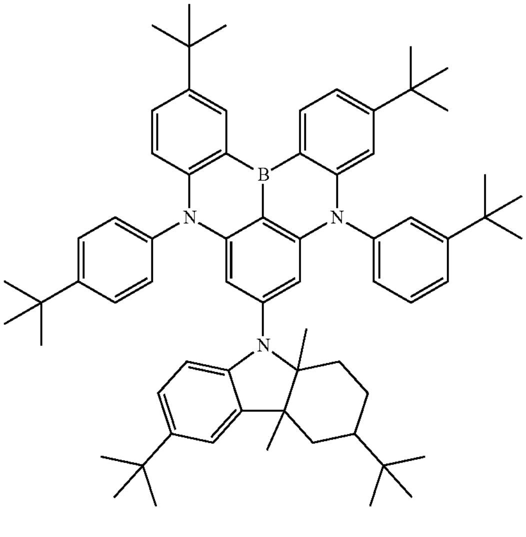
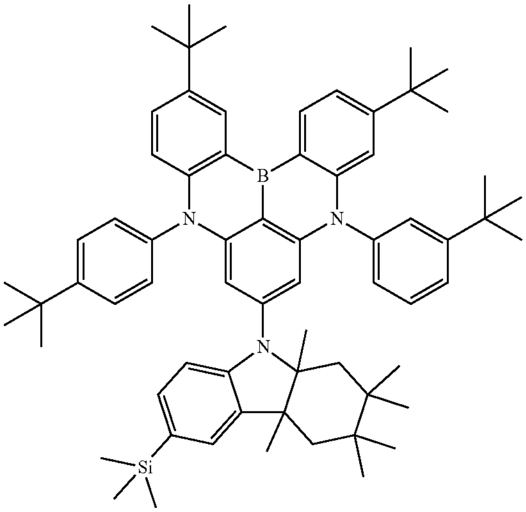

-continued
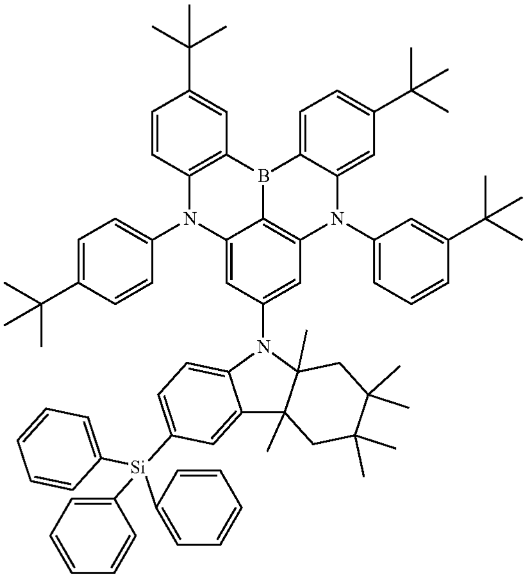
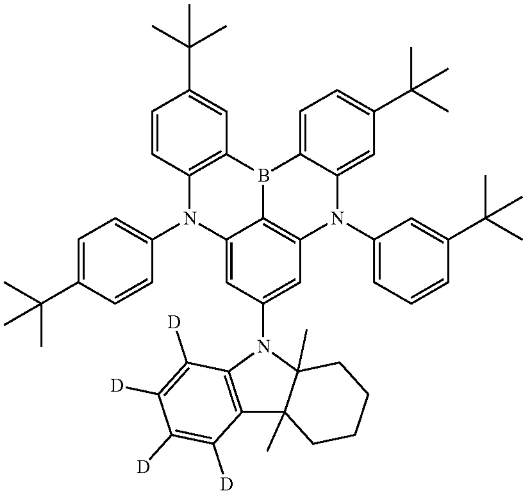
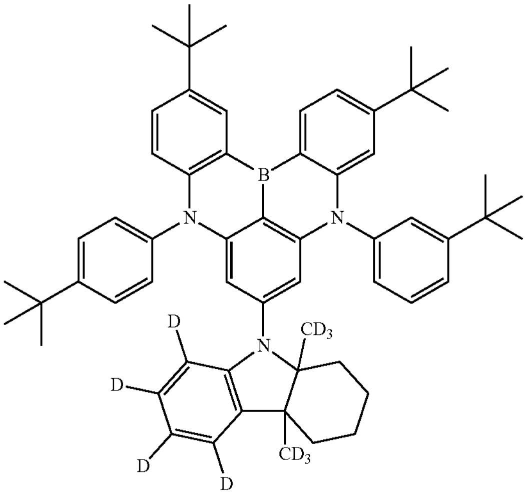
-continued
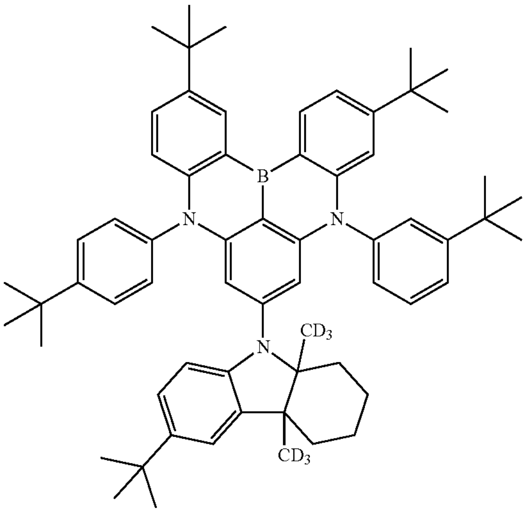
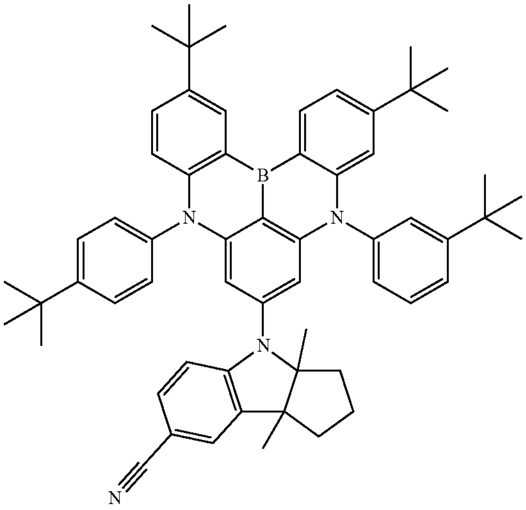
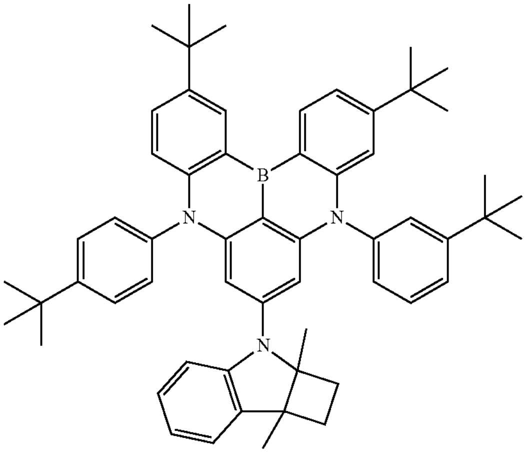

-continued
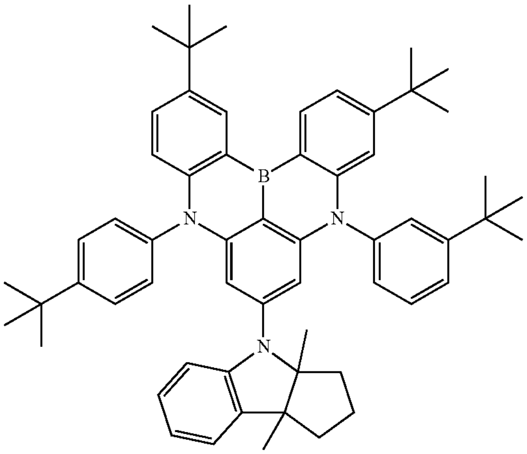
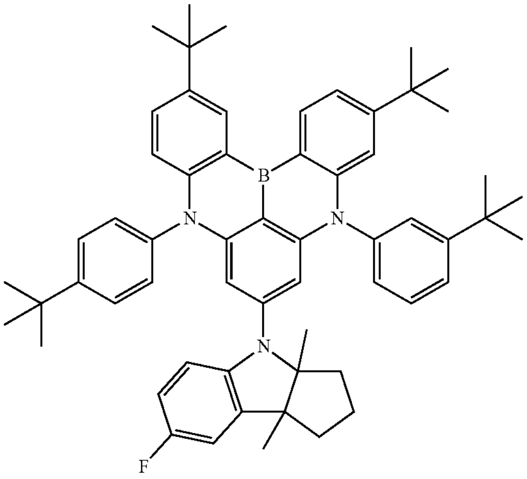
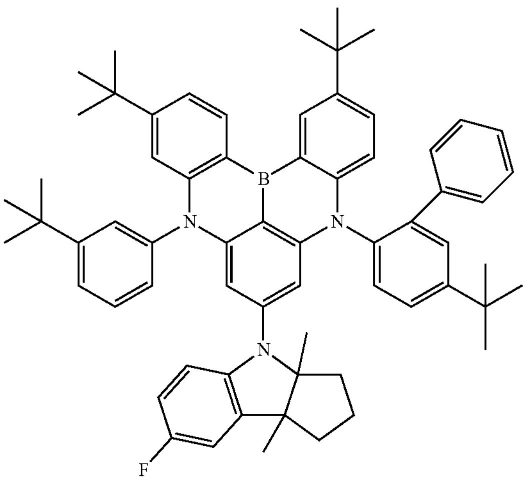
-continued
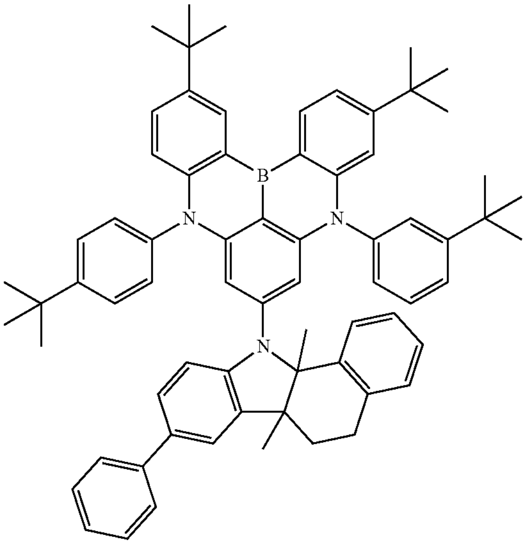
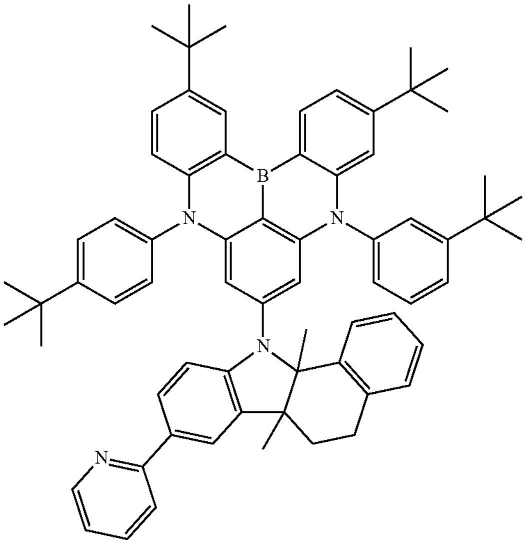
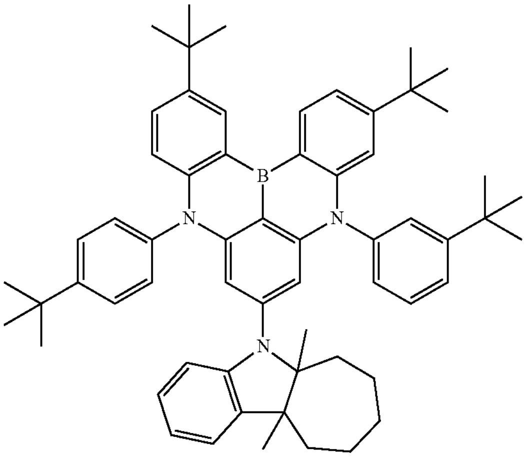

-continued
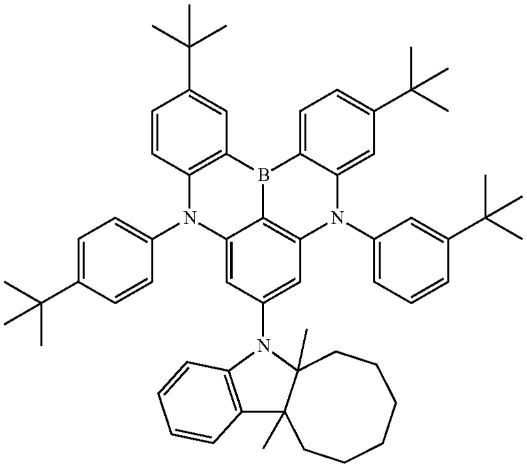
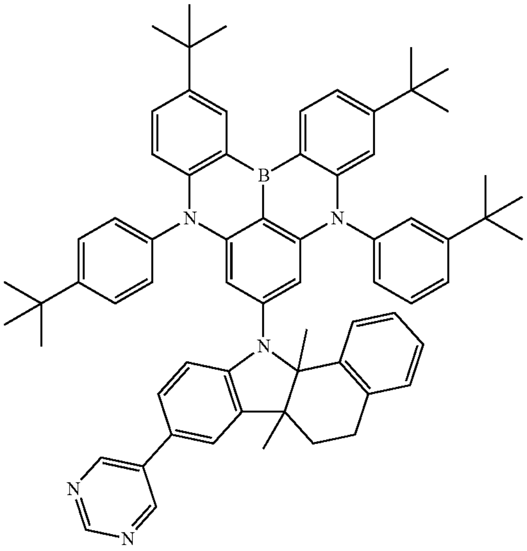
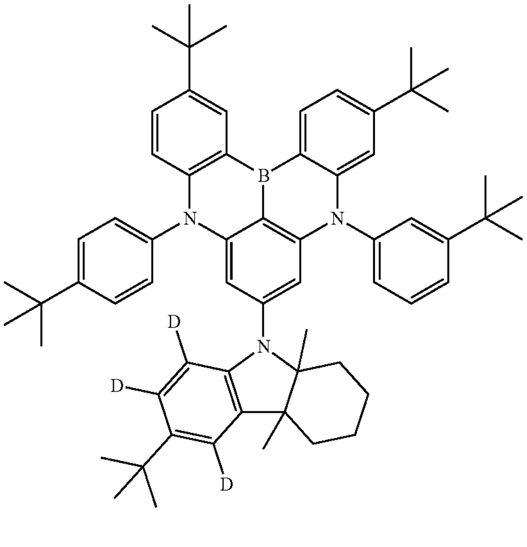
-continued
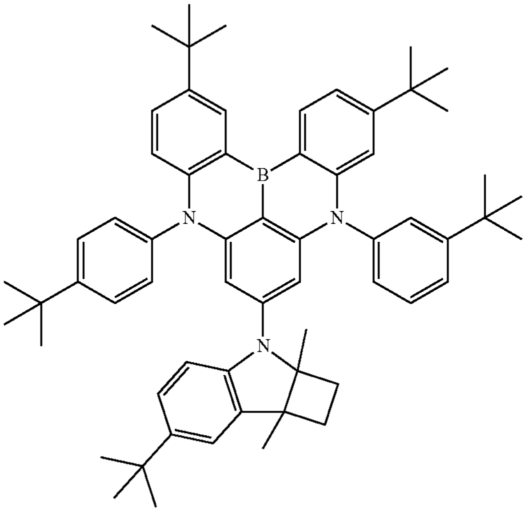
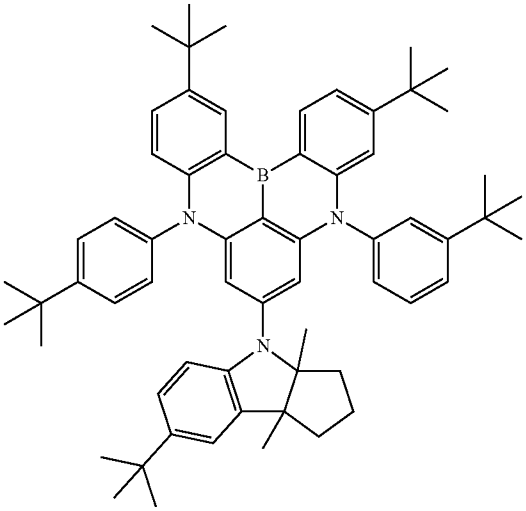
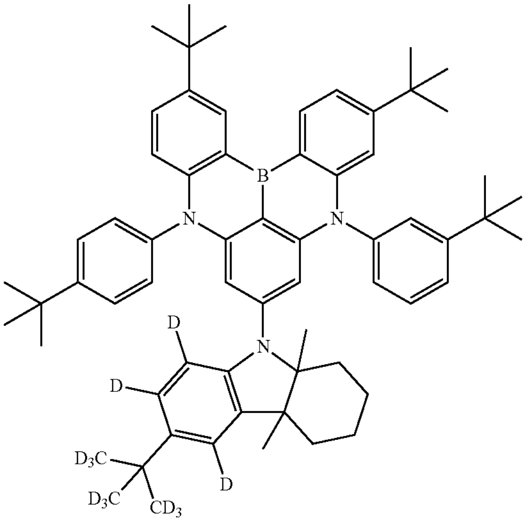

-continued
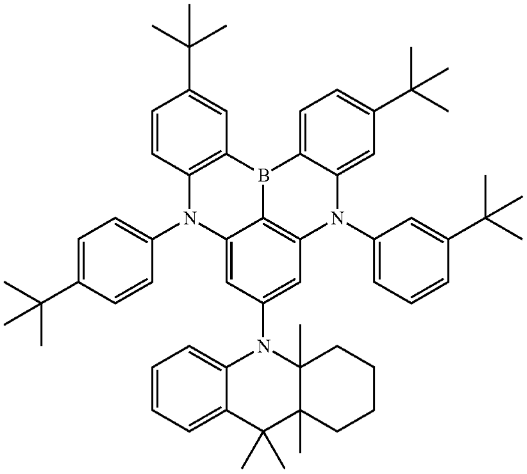
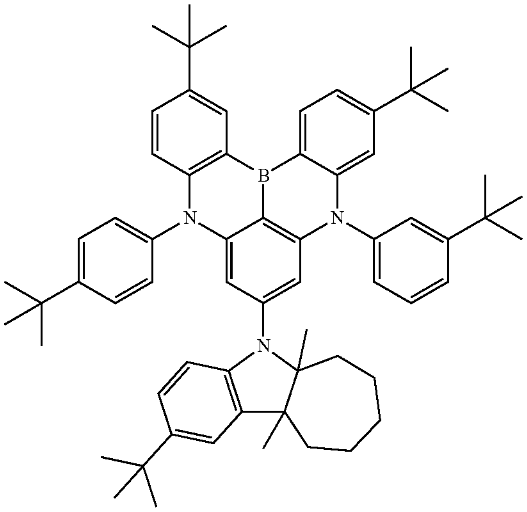
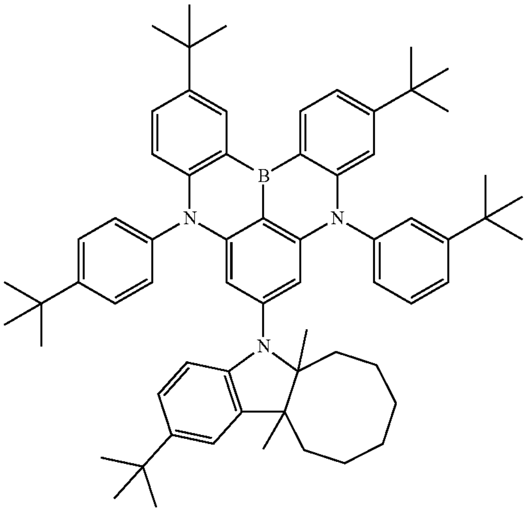
-continued
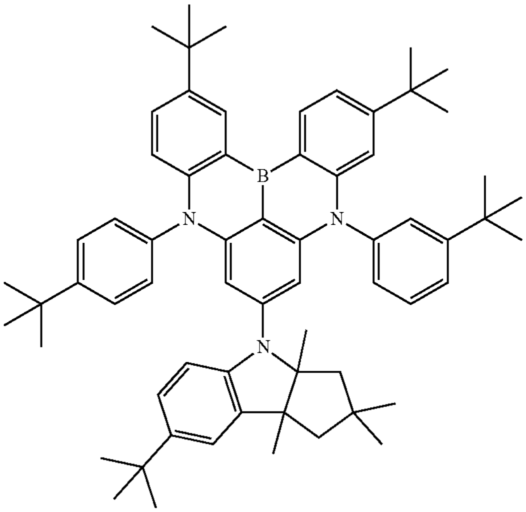
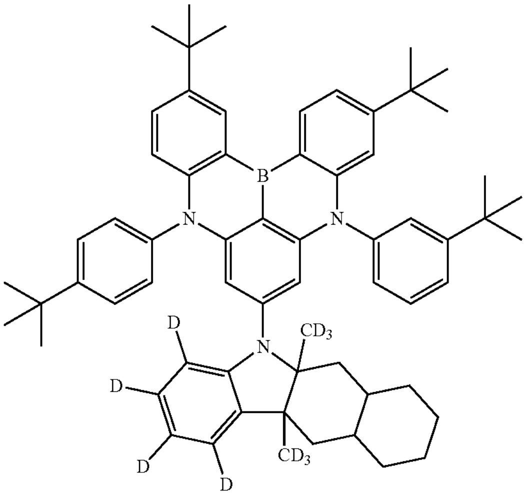
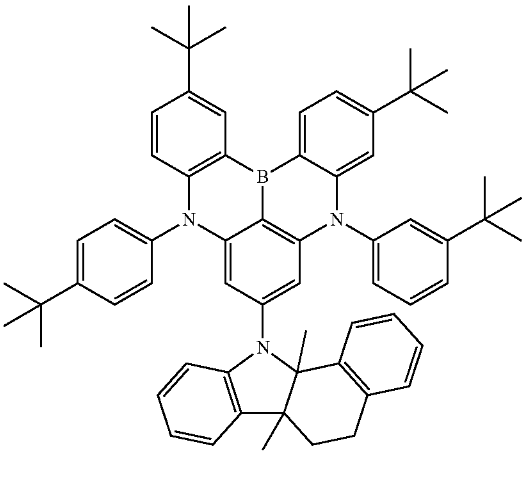

-continued
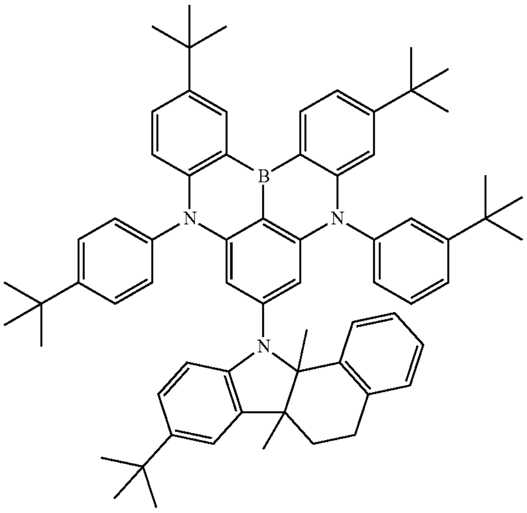
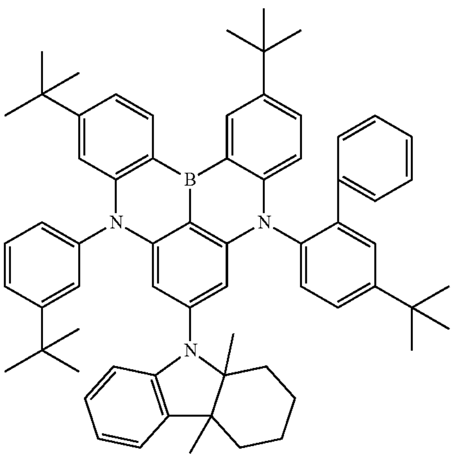
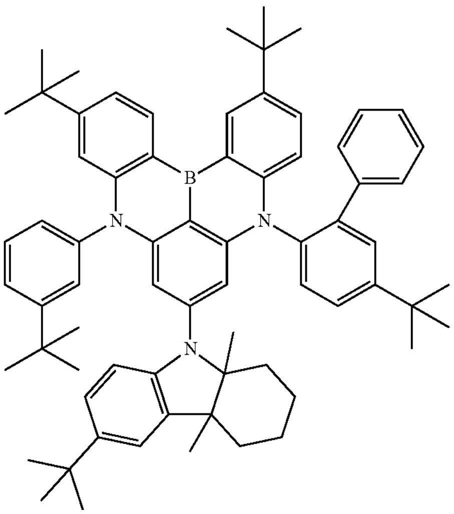
-continued
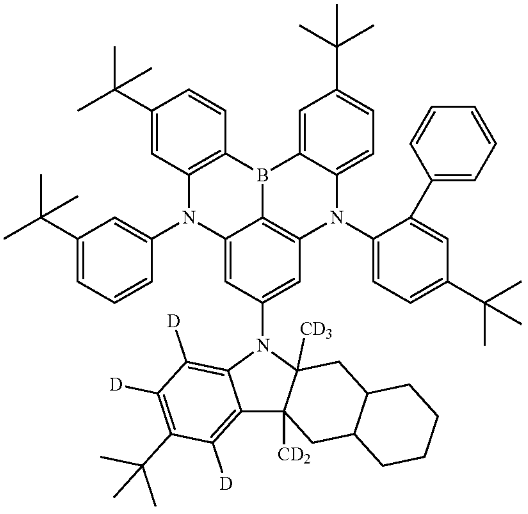
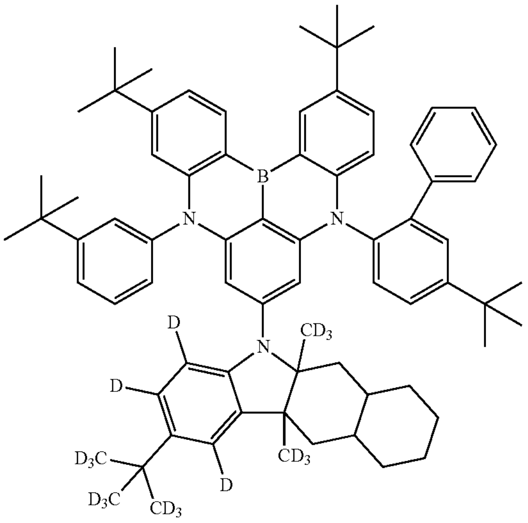
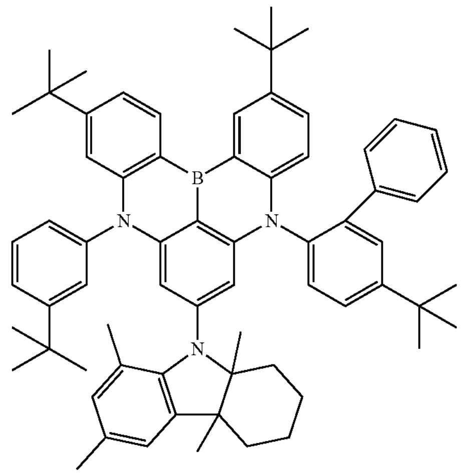

-continued
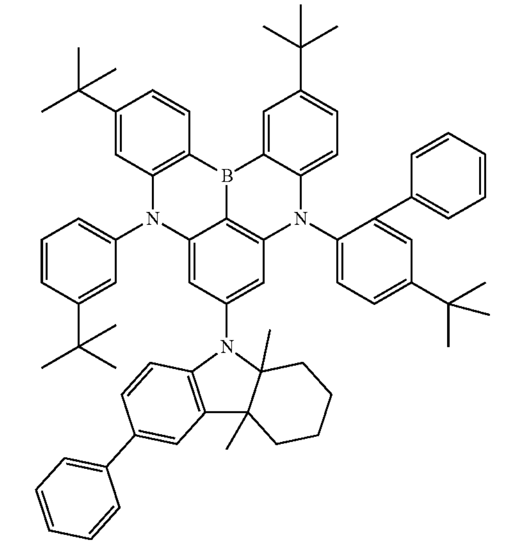
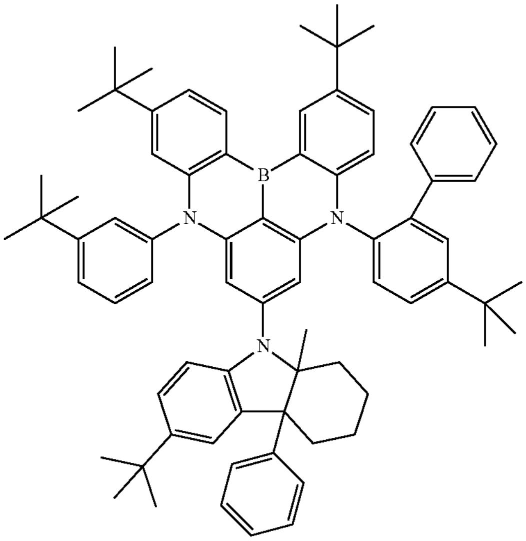
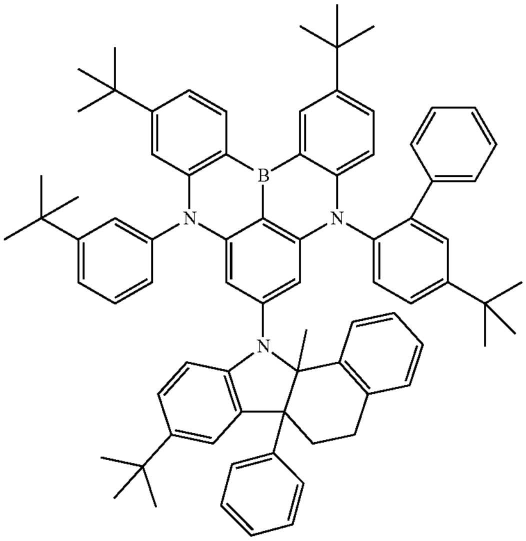
-continued
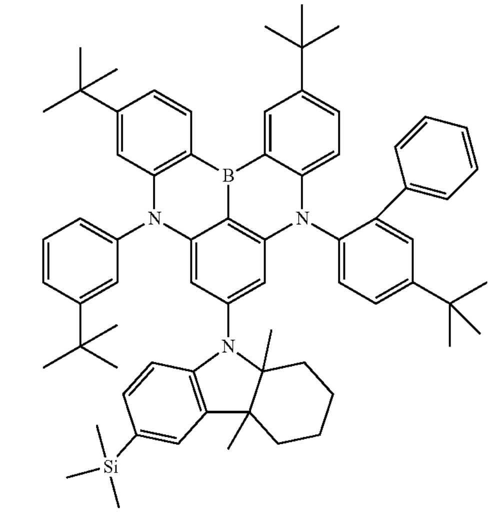
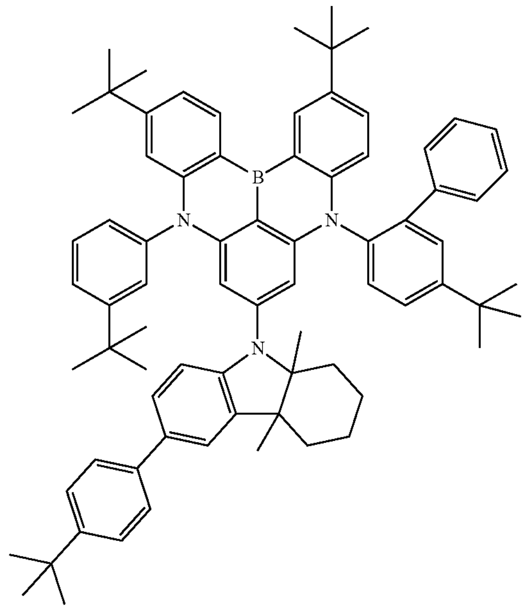
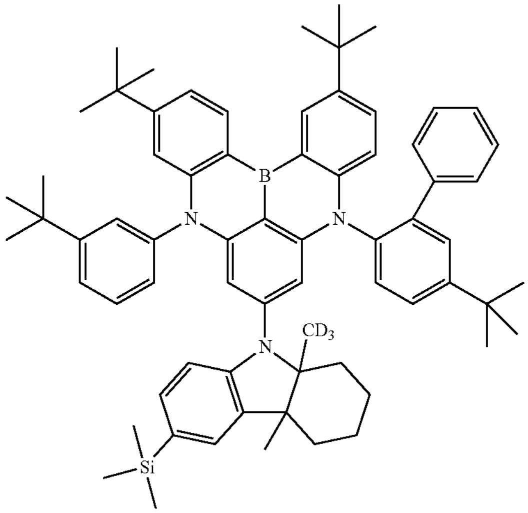

-continued
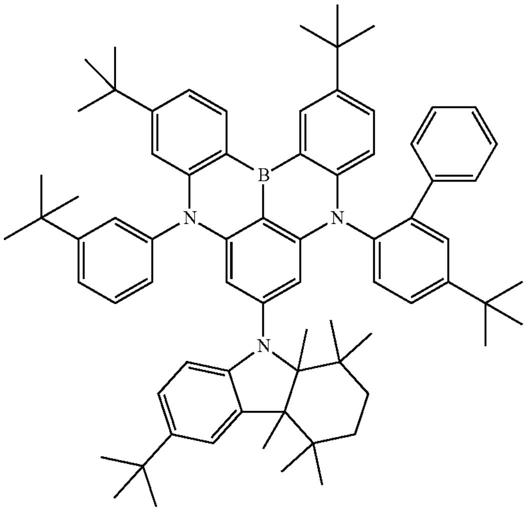
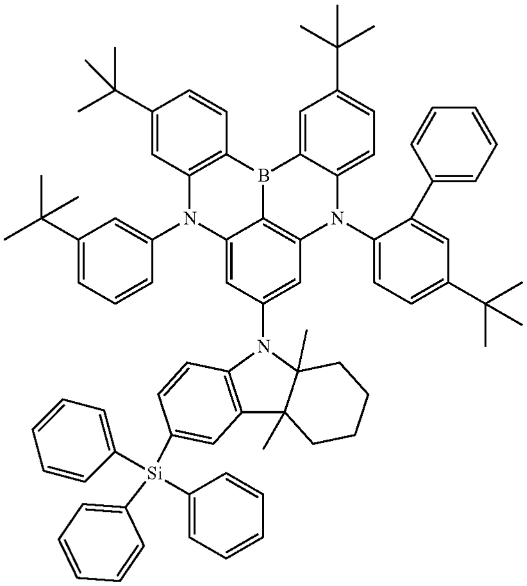
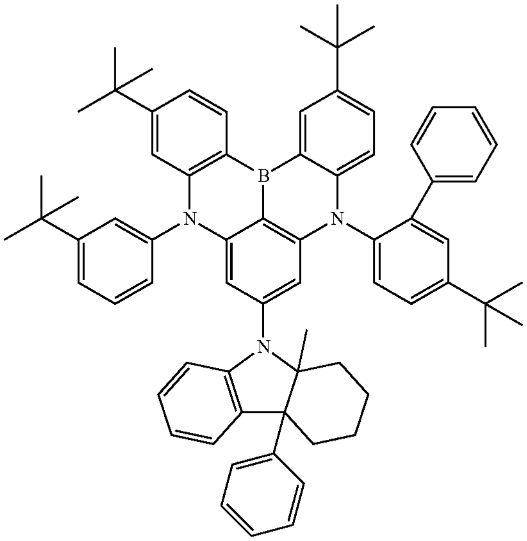
-continued
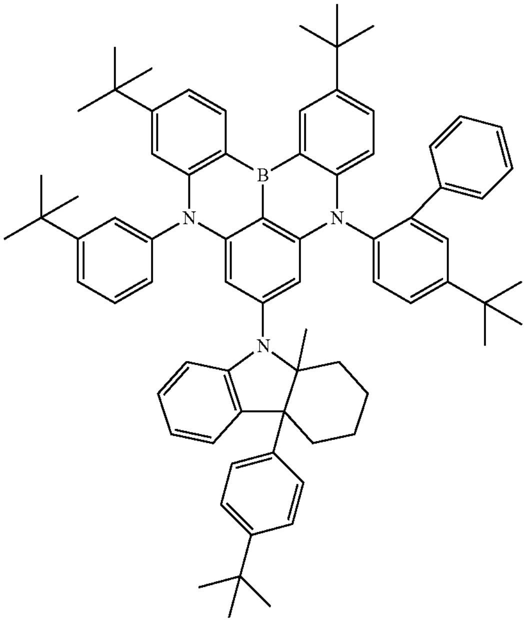
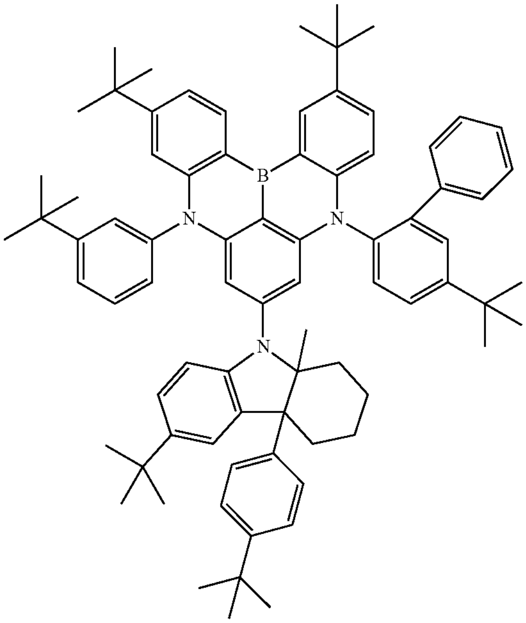 [SMILES: CC(C)(C)c1ccc(C23CCCCC2(C)N(c2cc4c5c(c2)N(c2ccc(C(C)(C)C)cc2-c2ccccc2)c2ccc(C(C)(C)C)cc2B5c2ccc(C(C)(C)C)cc2N4c2cccc(C(C)(C)C)c2)c2ccc(C(C)(C)C)cc23)cc1]

-continued
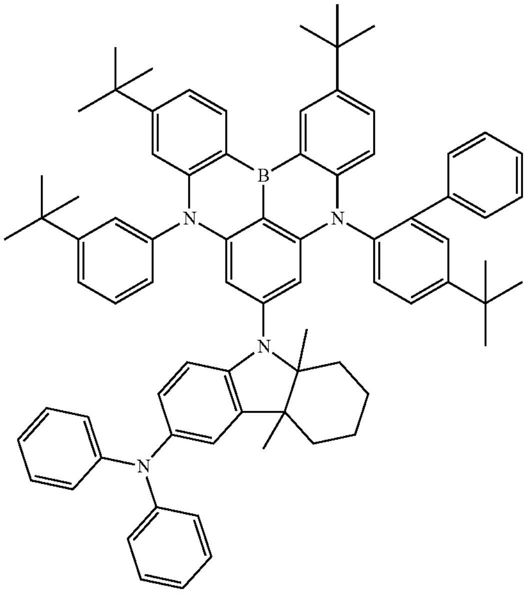
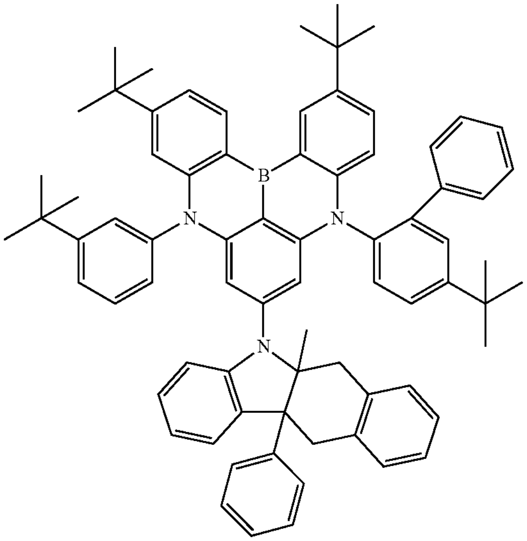
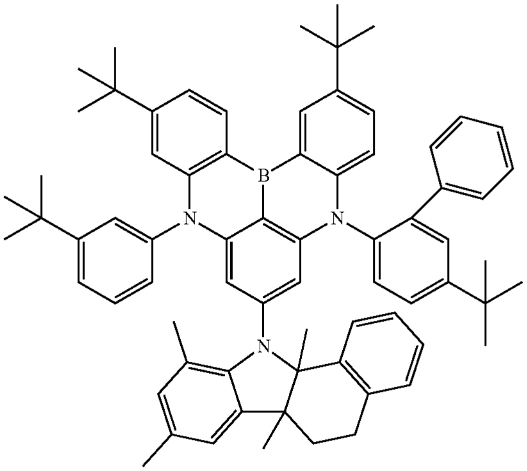
-continued
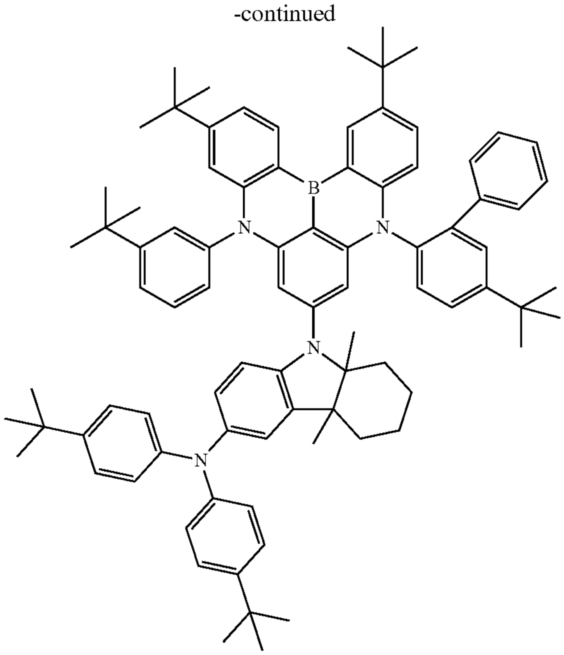
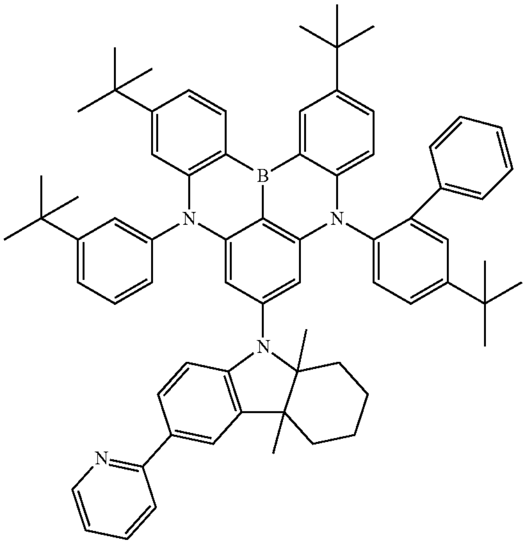
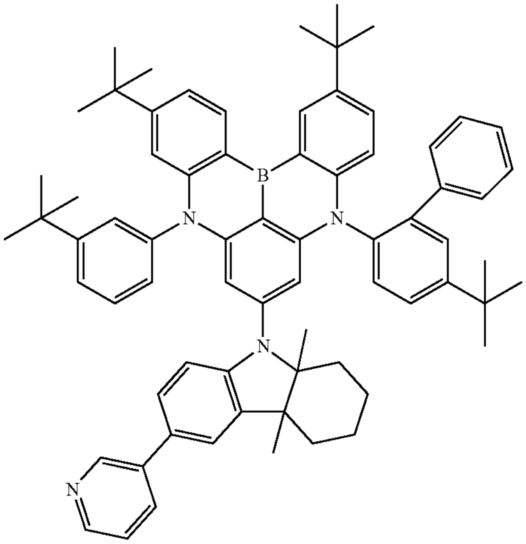

-continued
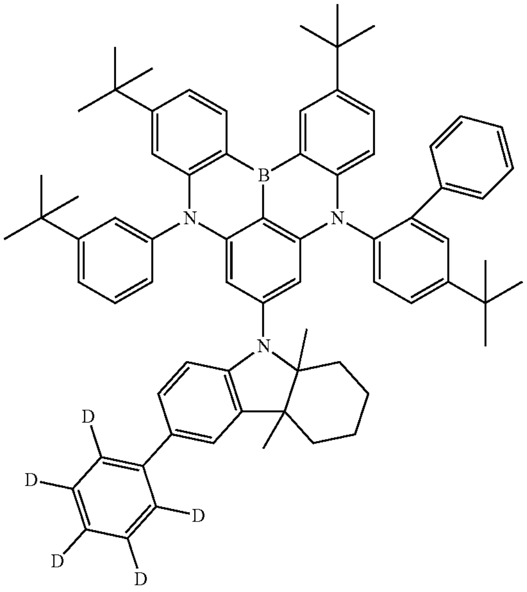
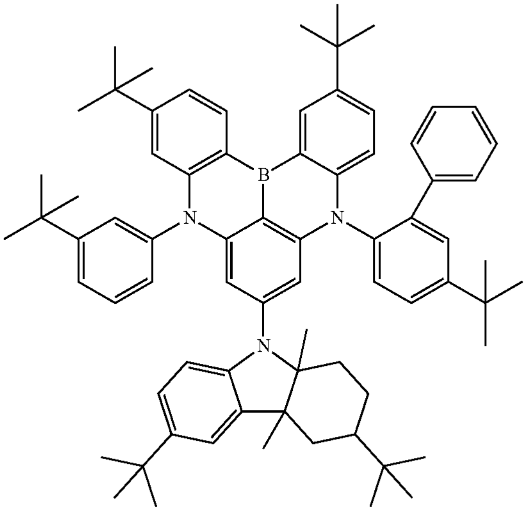
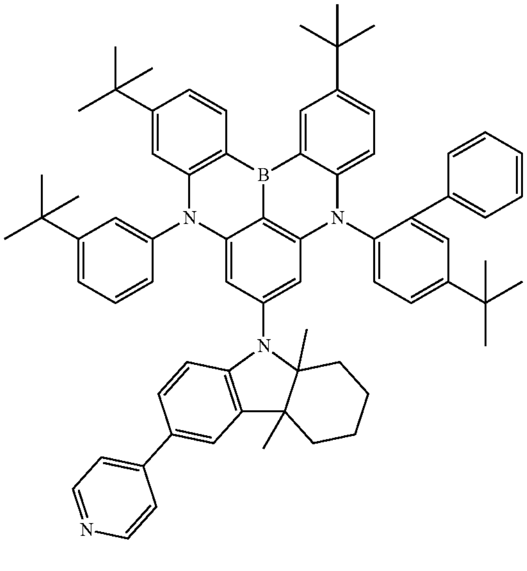
-continued
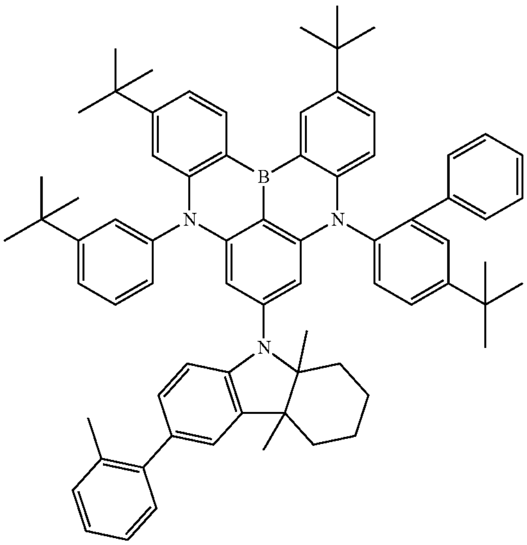
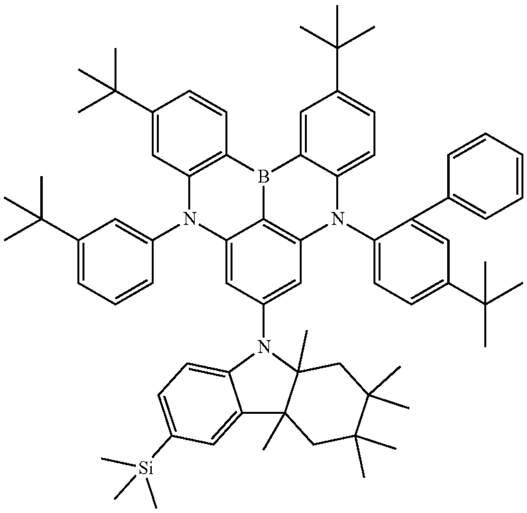
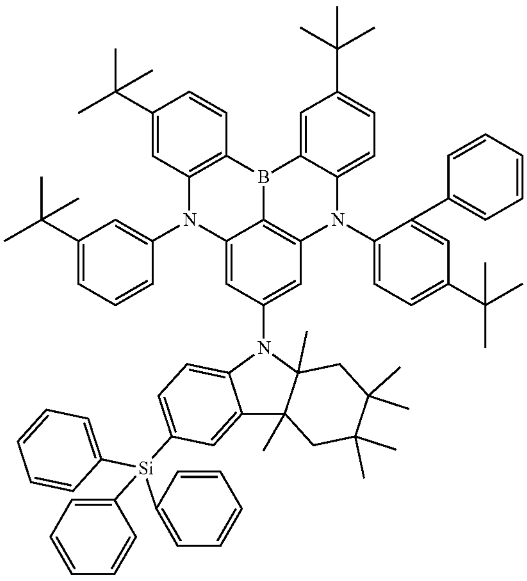

-continued
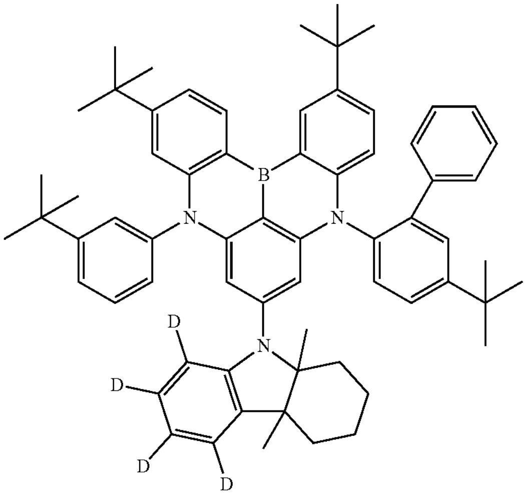
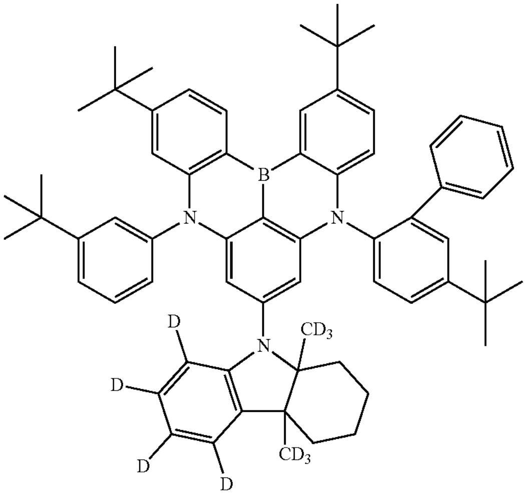
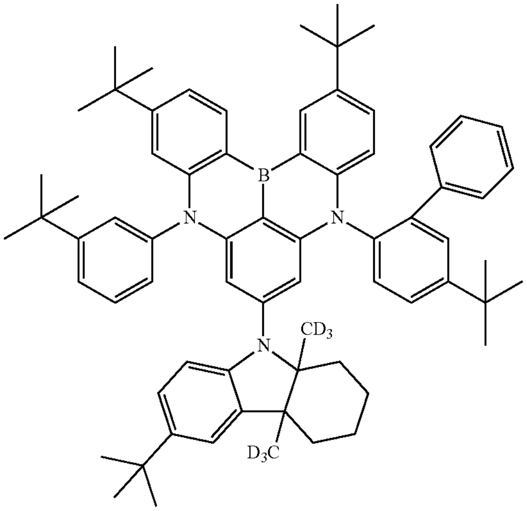
-continued
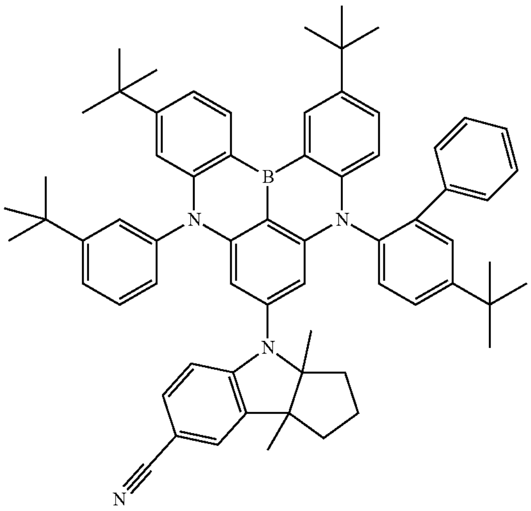
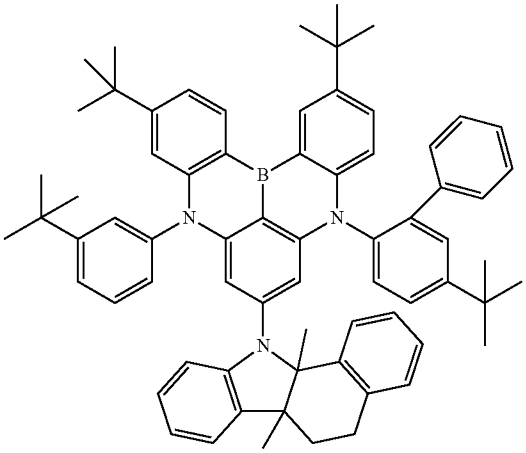
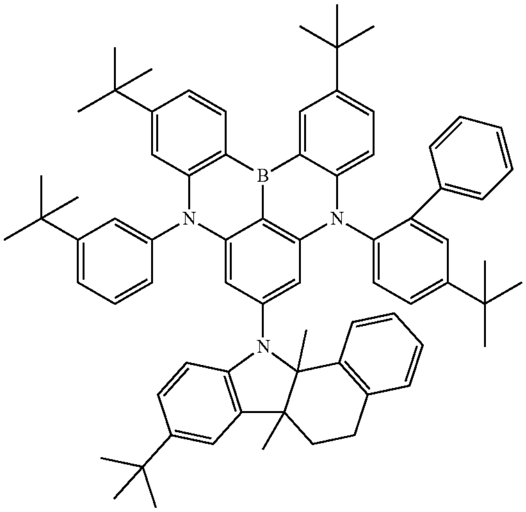

-continued
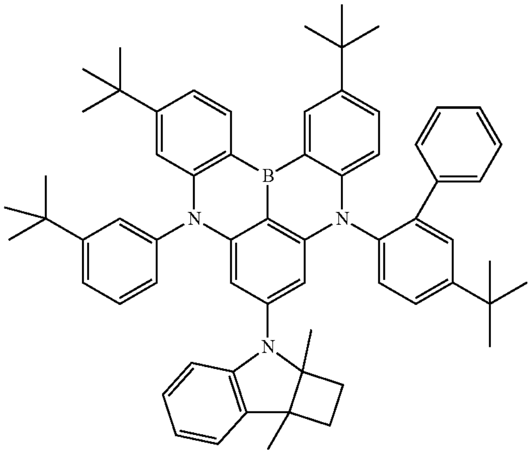
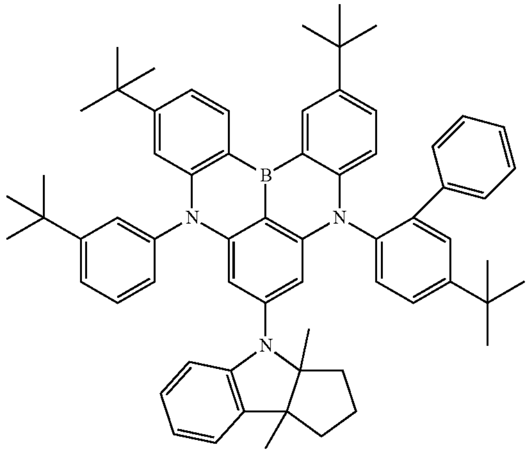
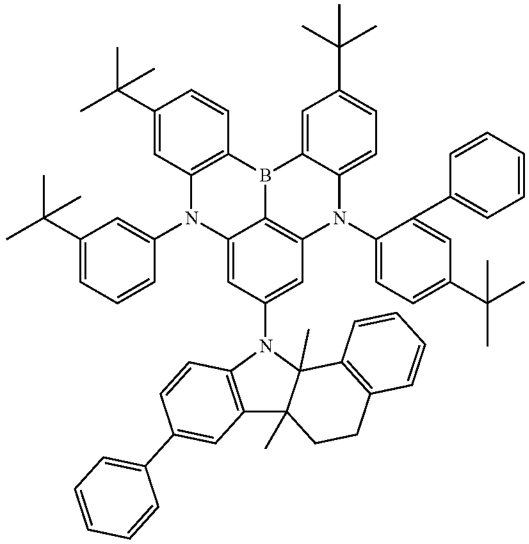
-continued
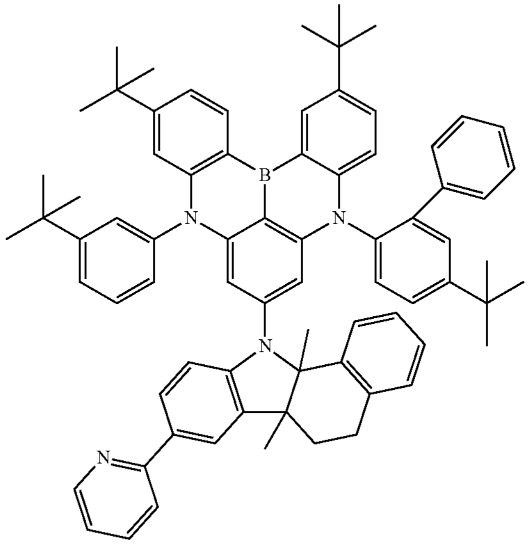
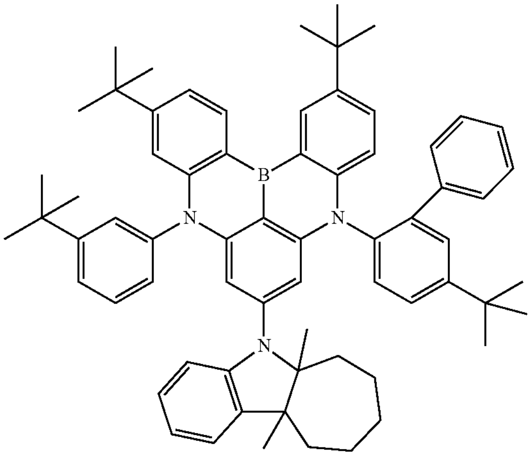
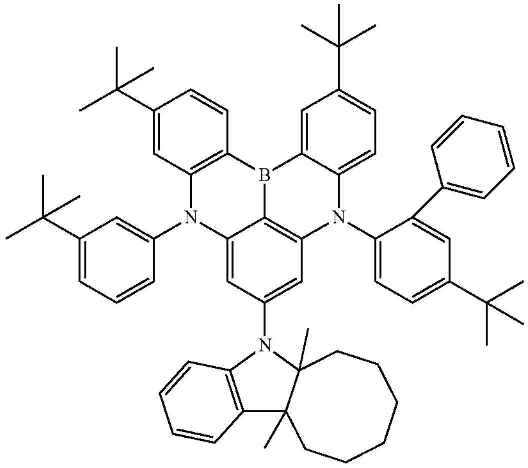

-continued
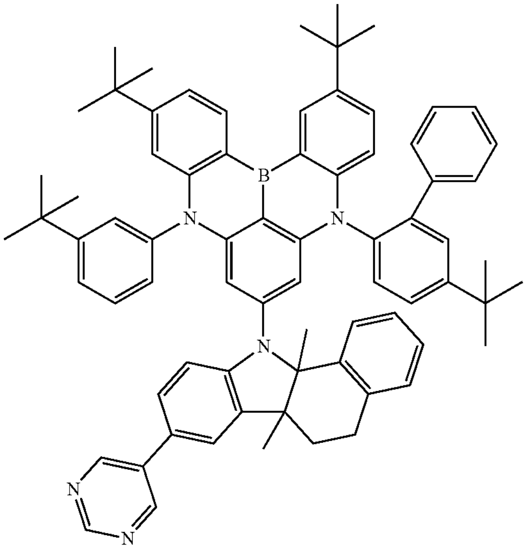
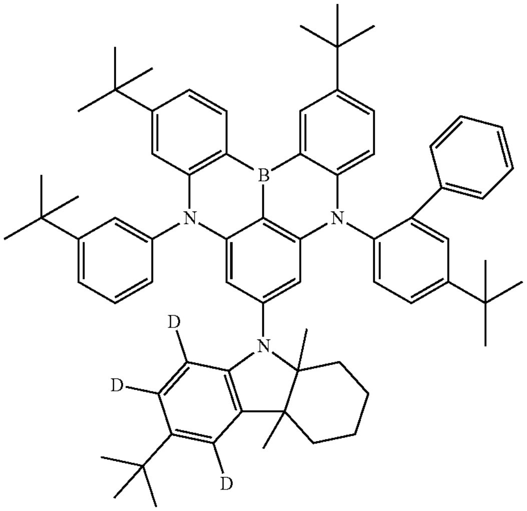
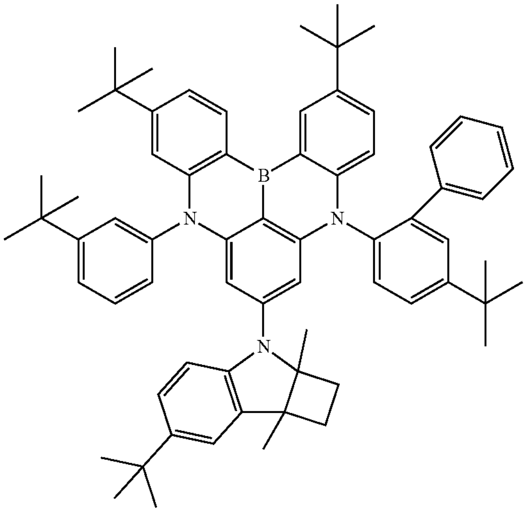
-continued
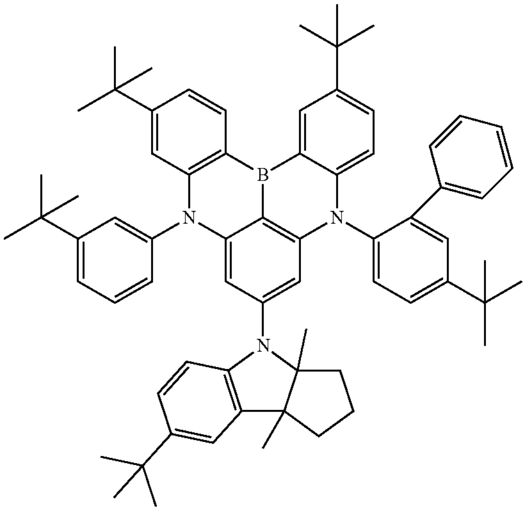
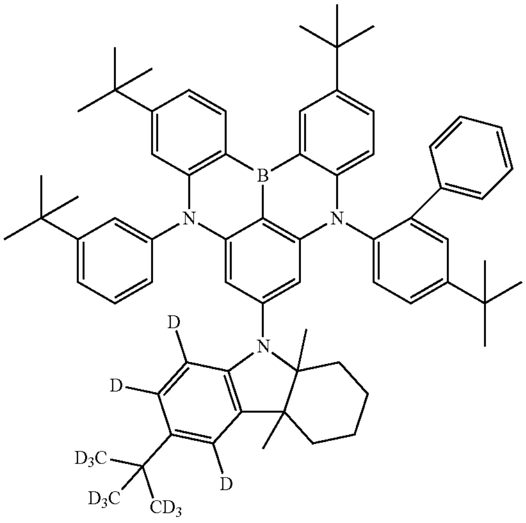
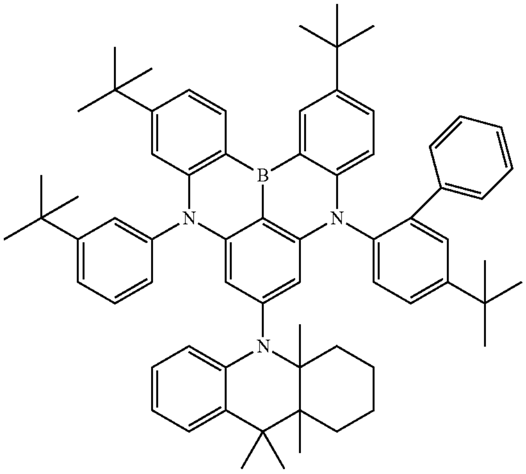

-continued
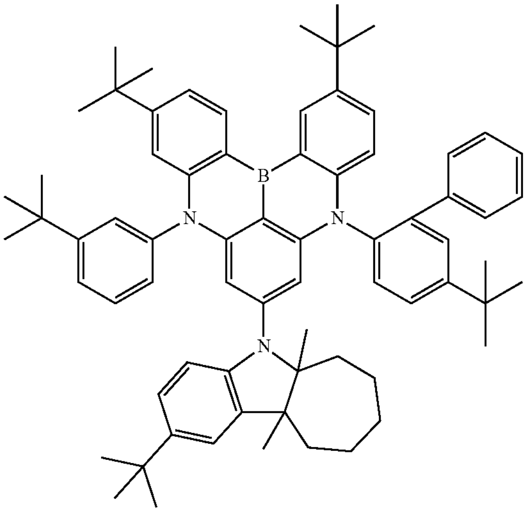
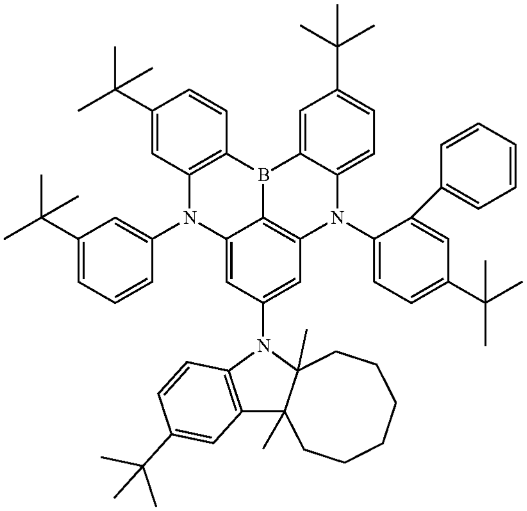
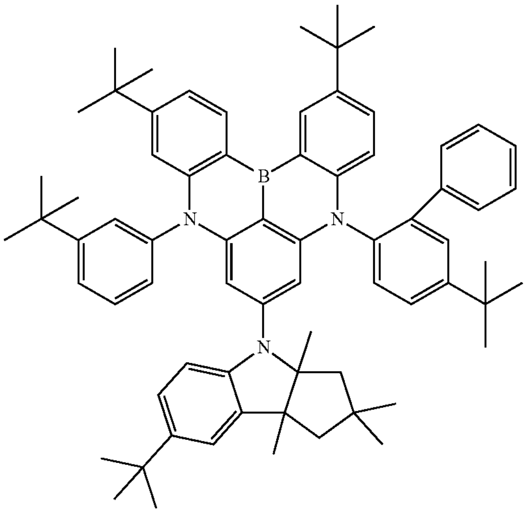
-continued
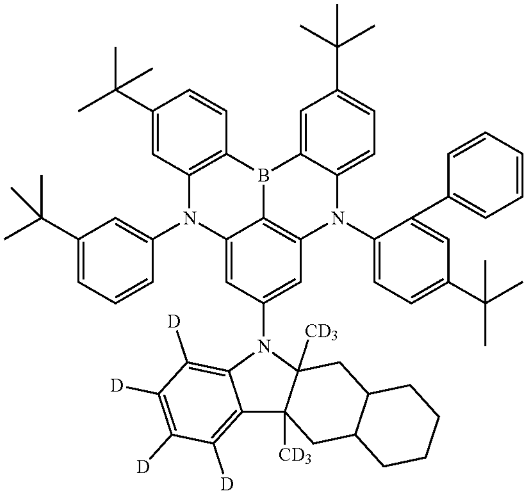
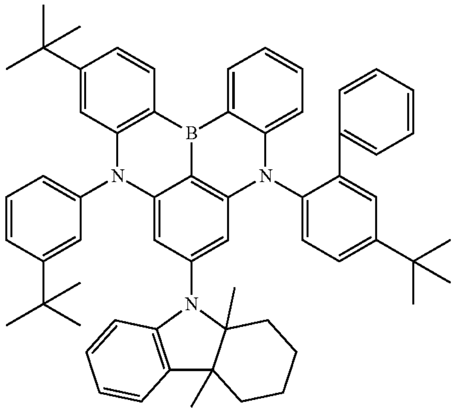
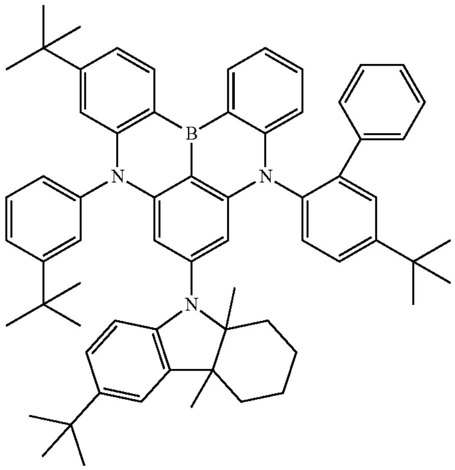

-continued
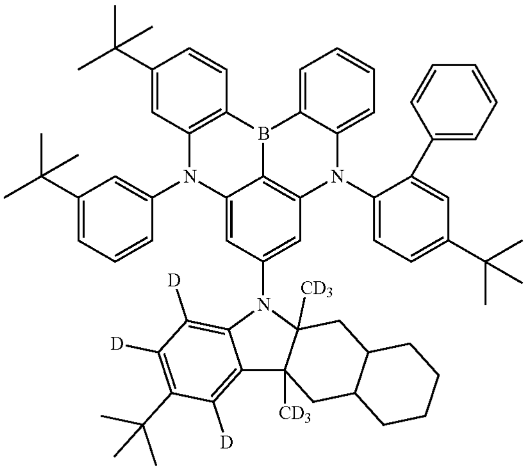
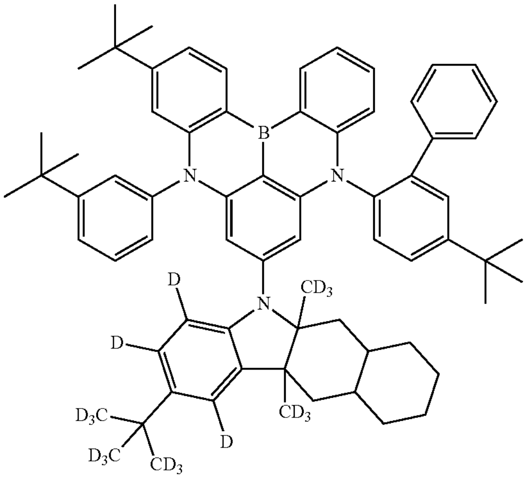
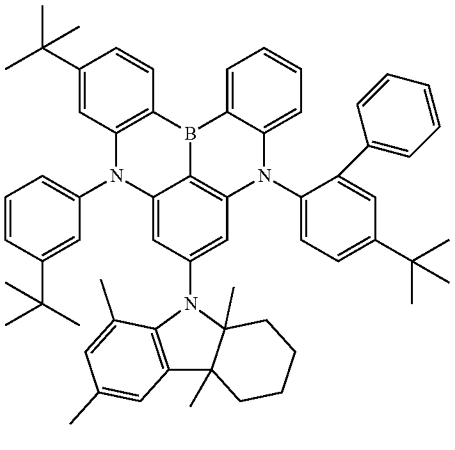
-continued
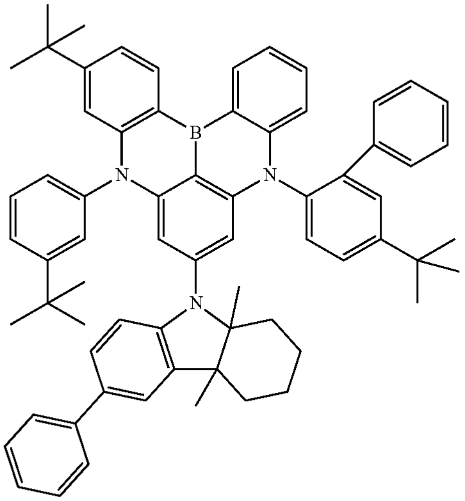
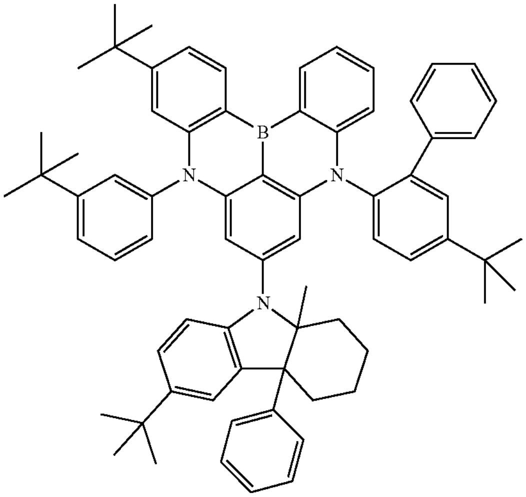
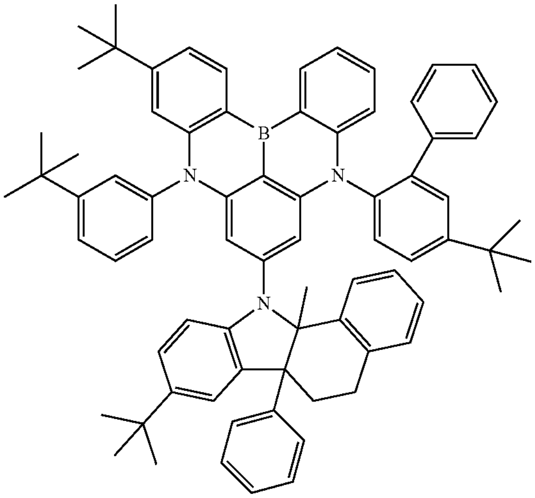

-continued
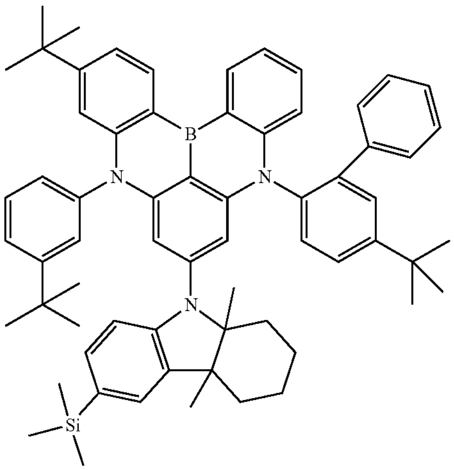
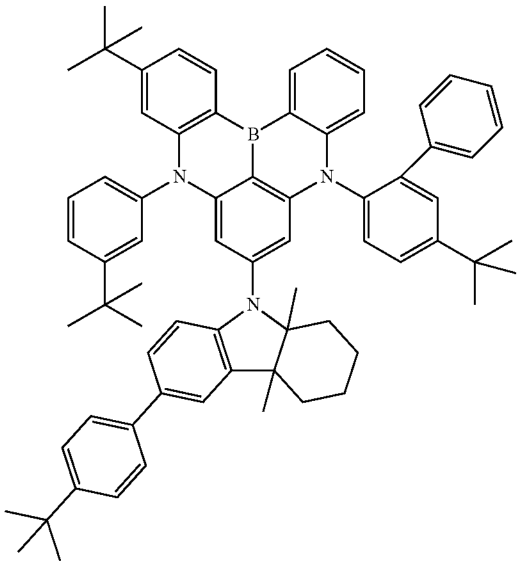
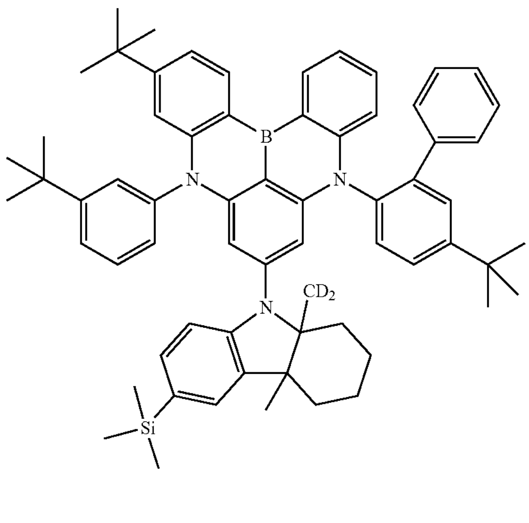
-continued
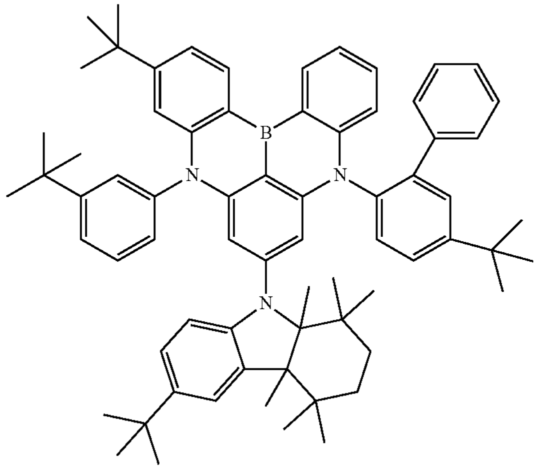
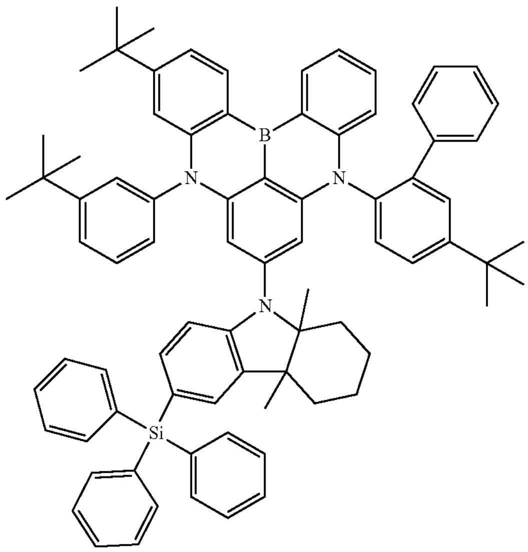
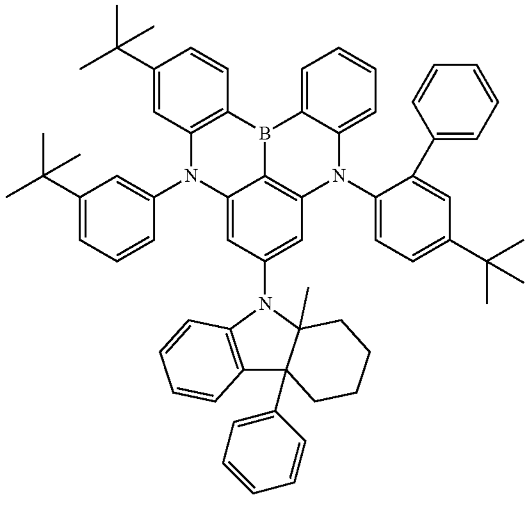

-continued
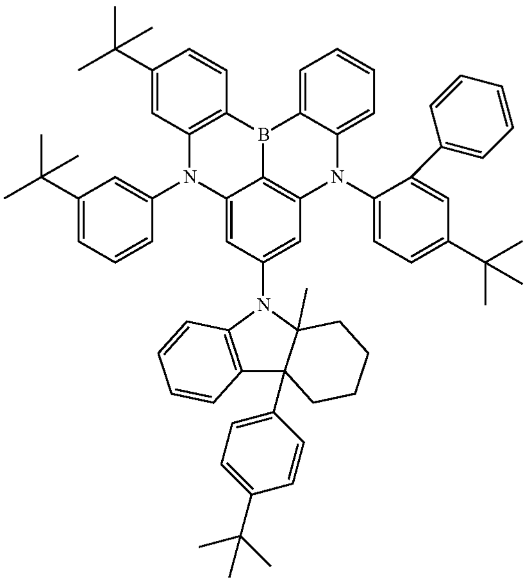
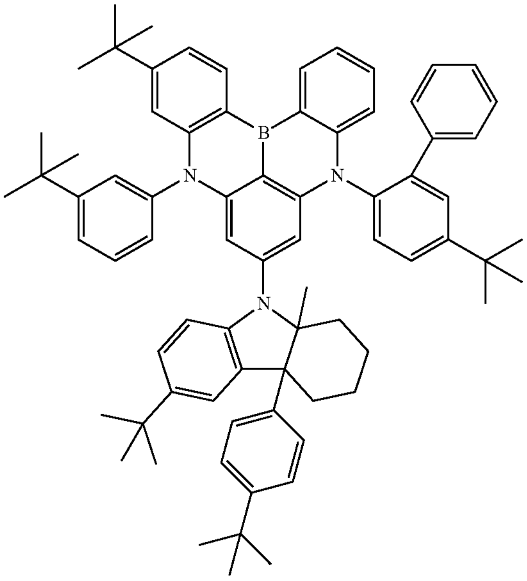
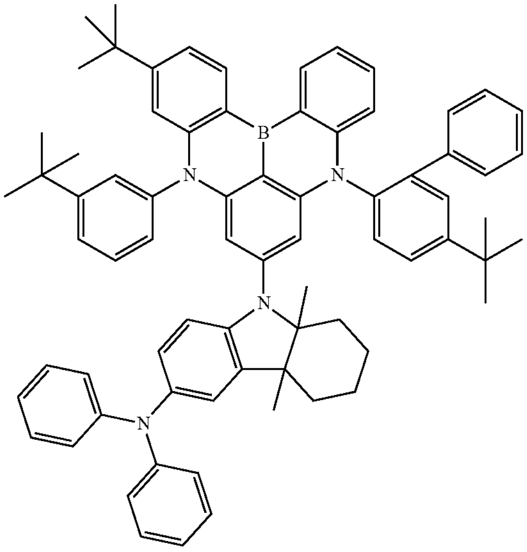
-continued
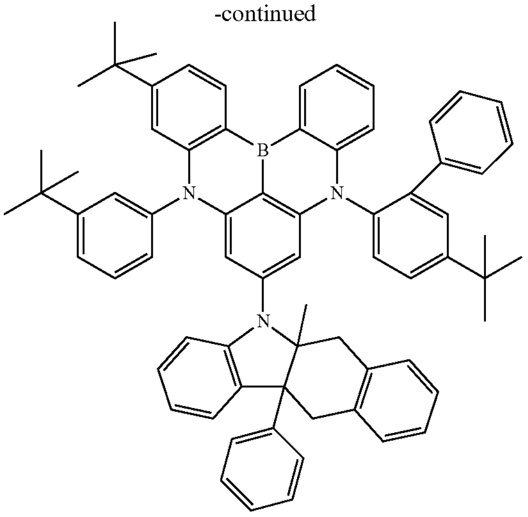
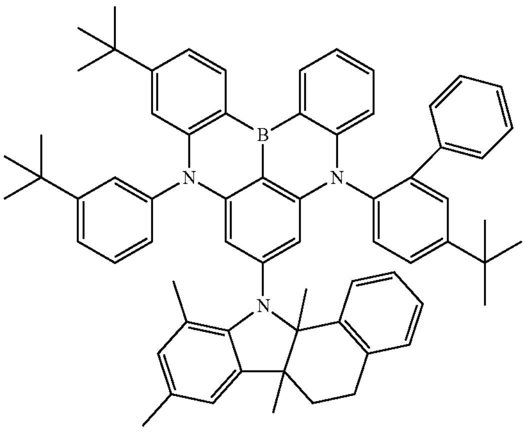
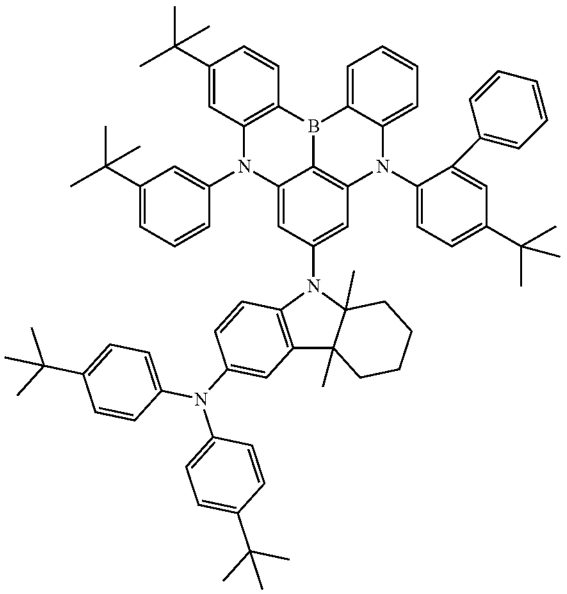

-continued
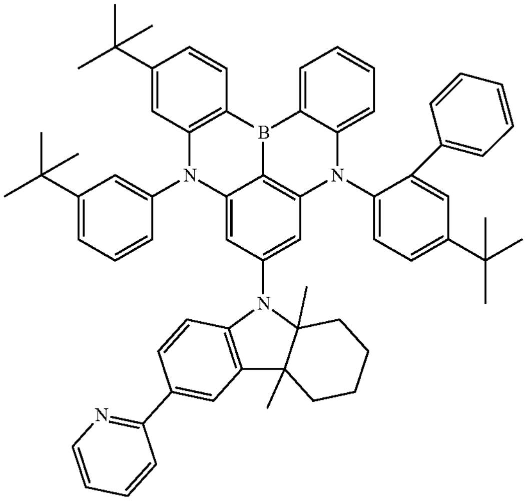
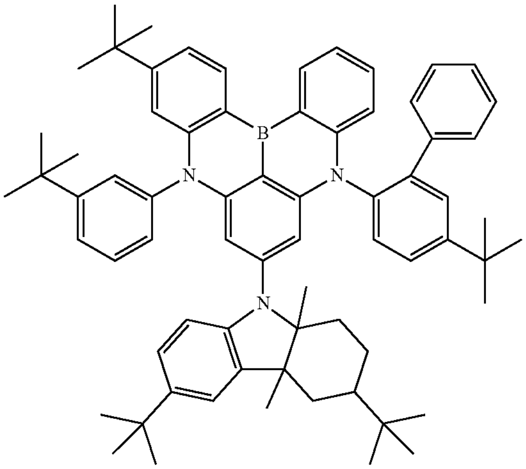
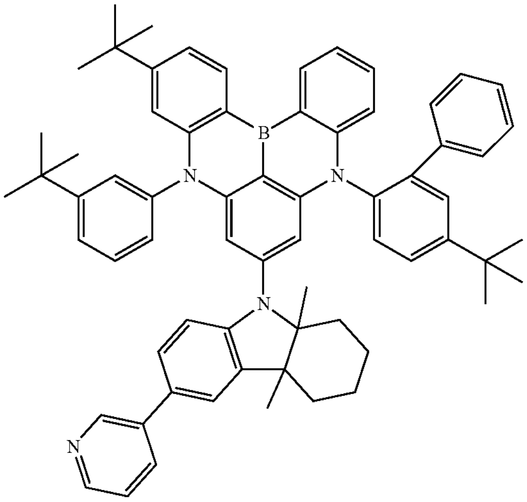
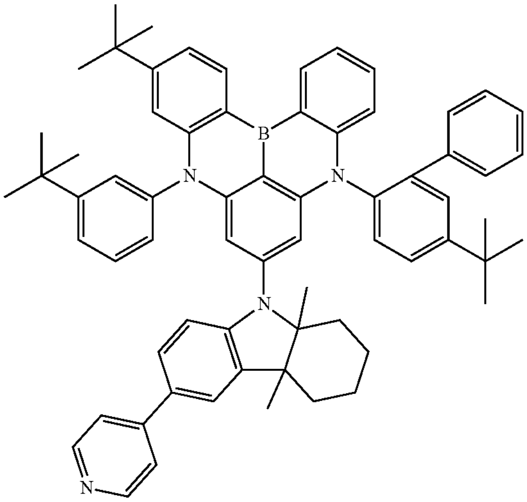
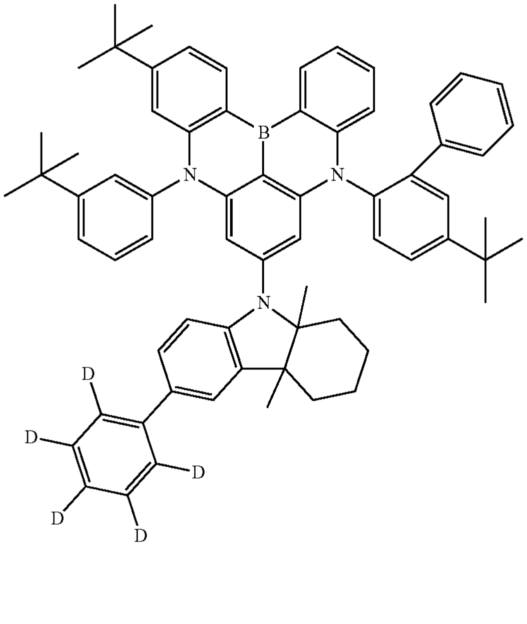
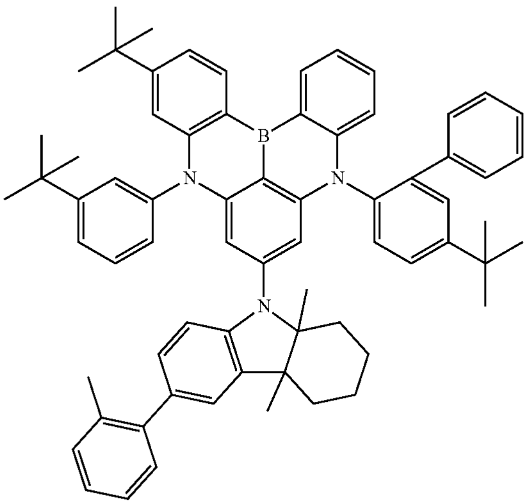

-continued
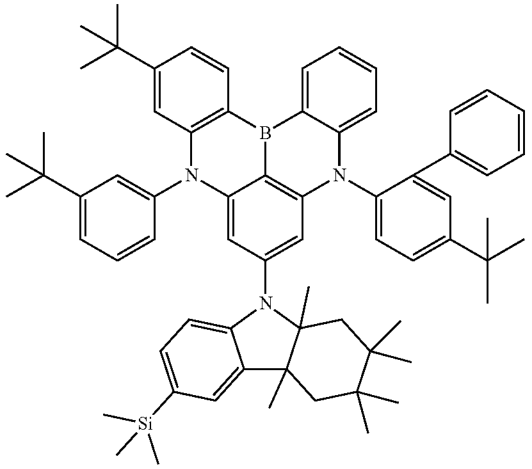
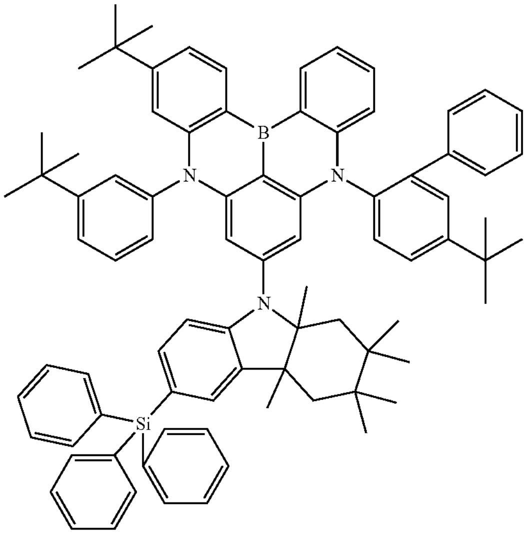
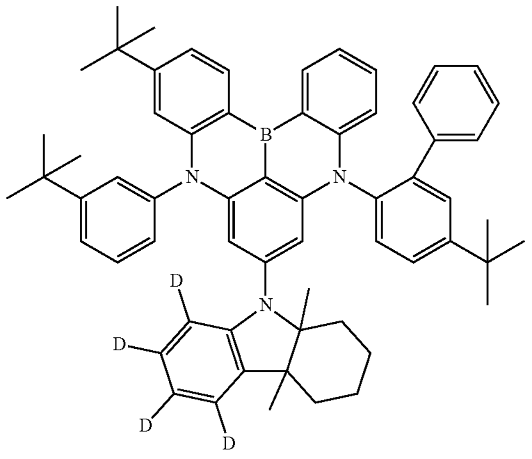
-continued
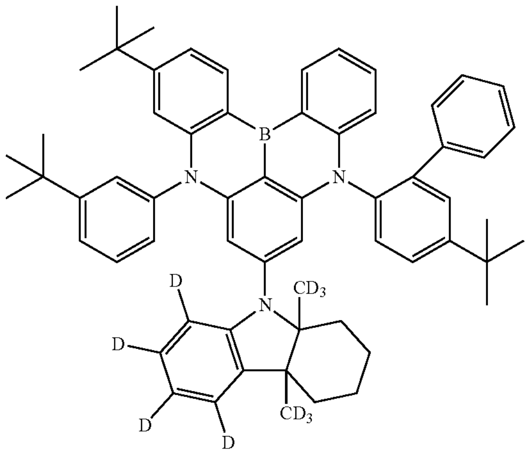
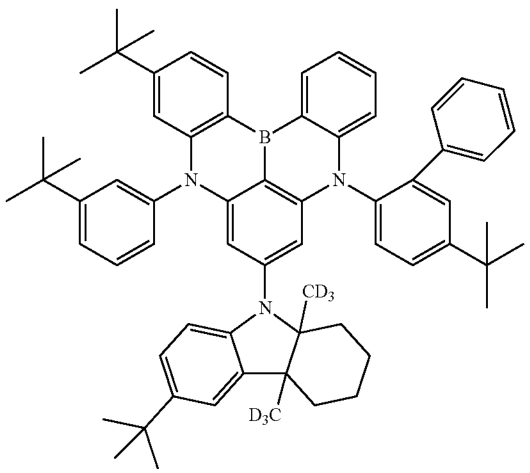
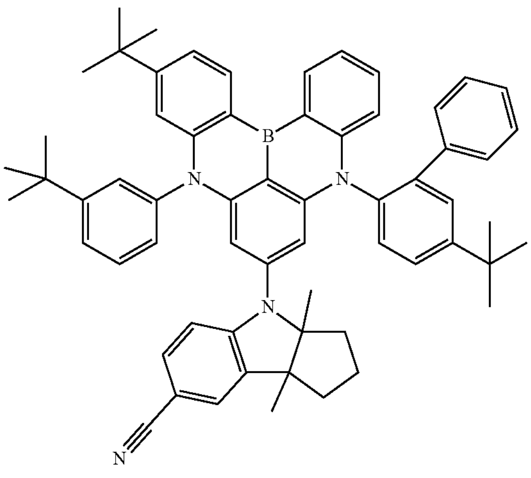

-continued
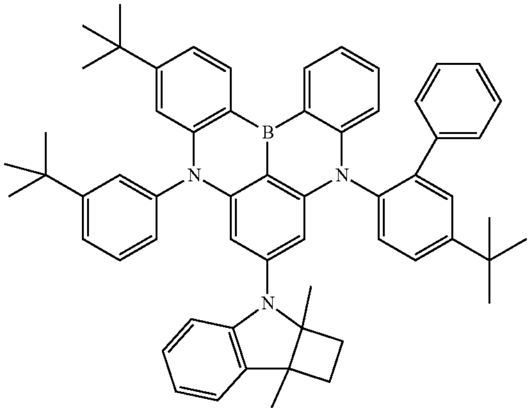
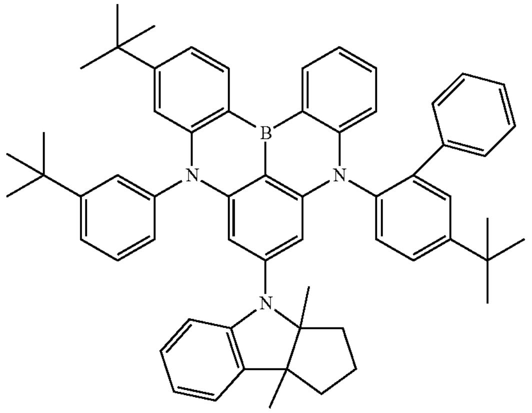
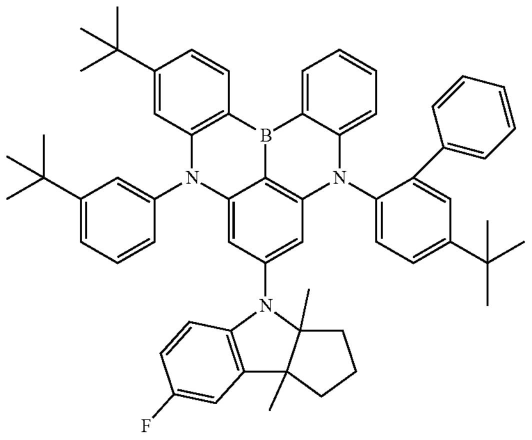
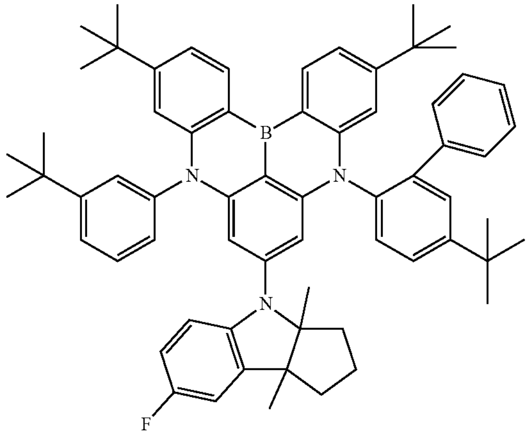
-continued
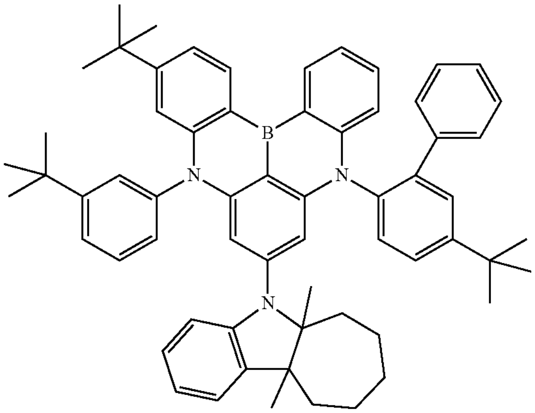
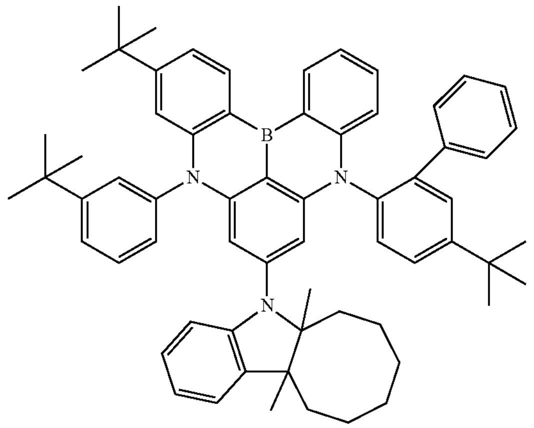
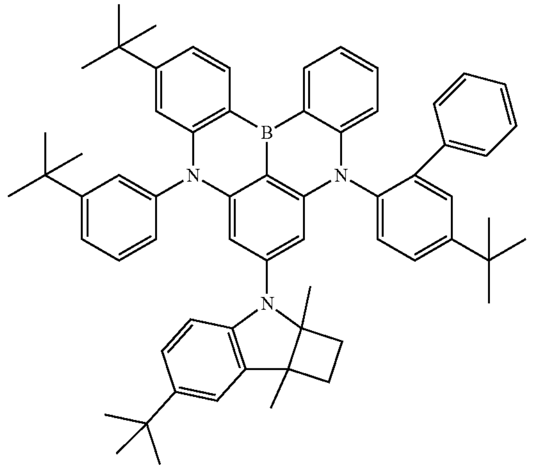

-continued
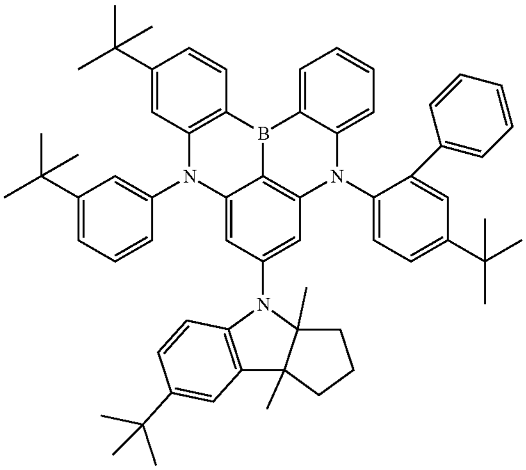
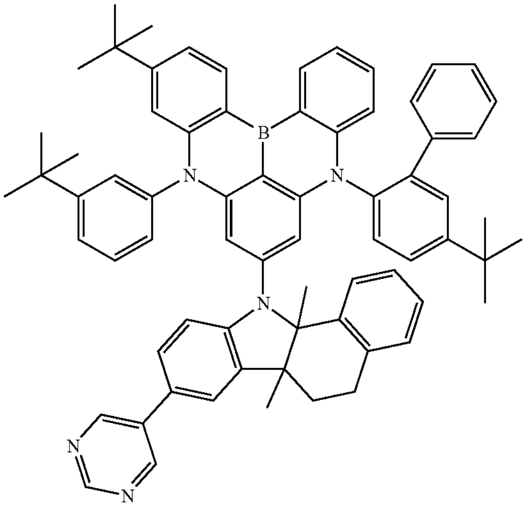
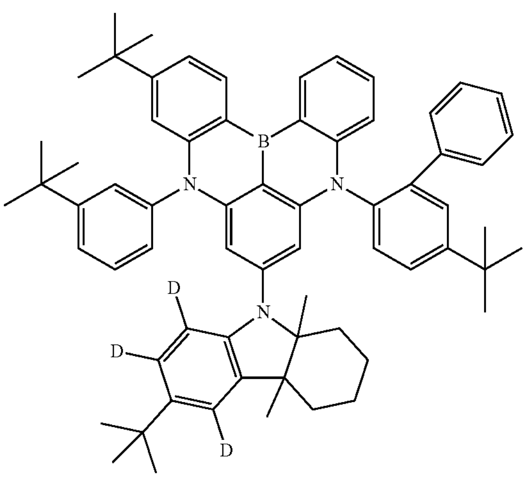
-continued
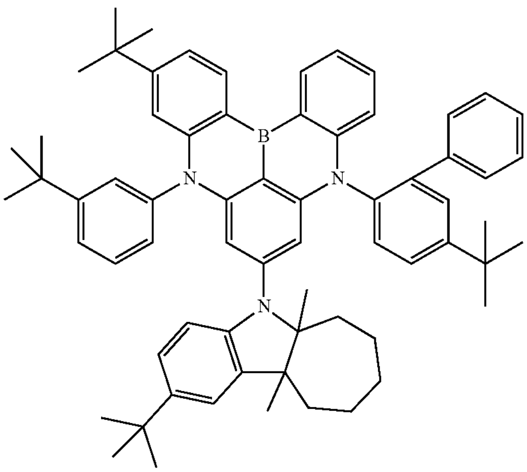
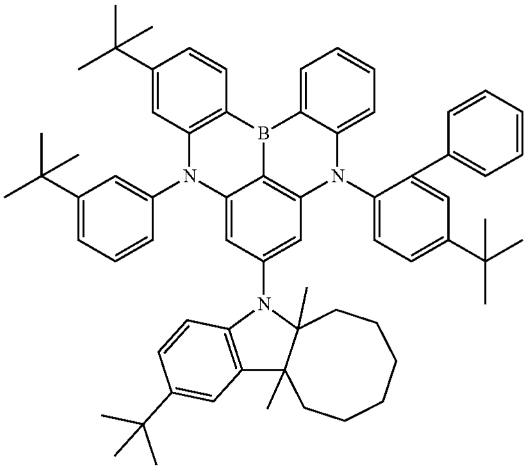
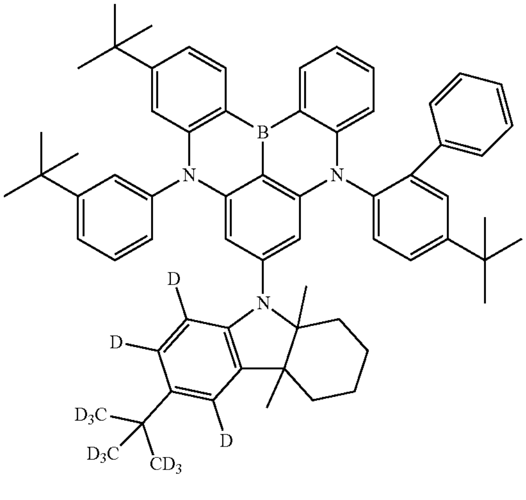

-continued
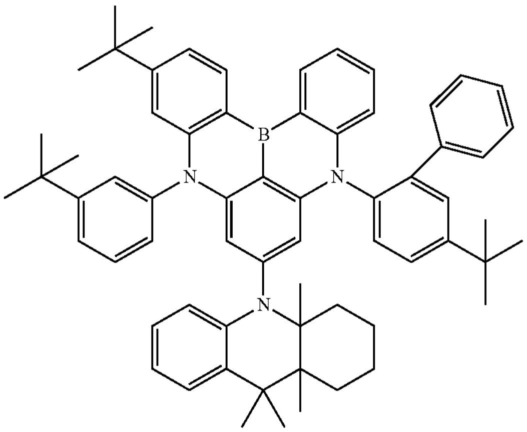
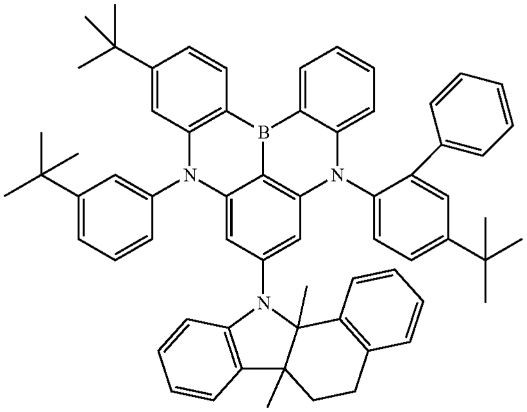
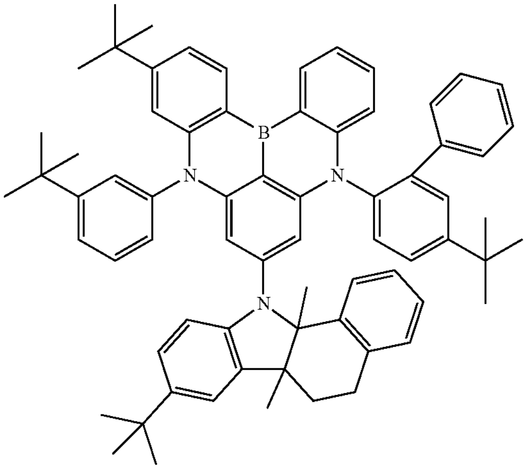
-continued
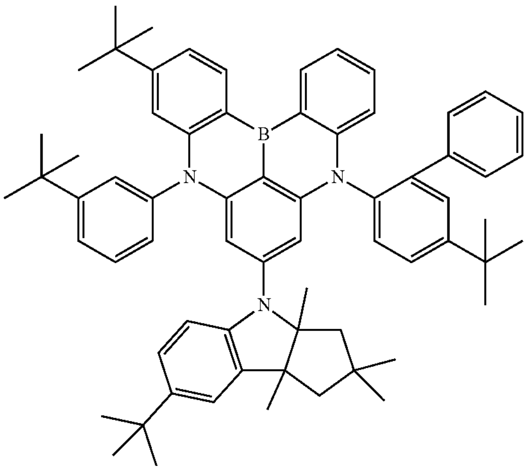
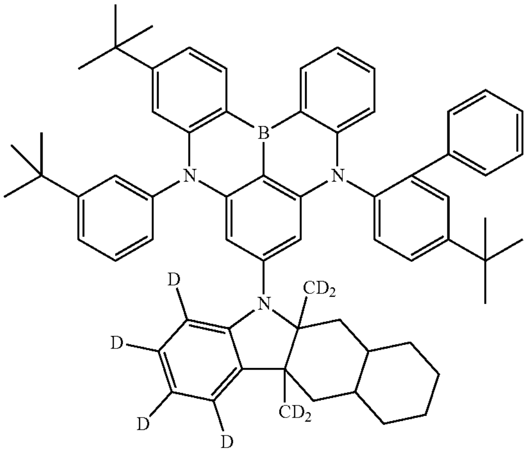
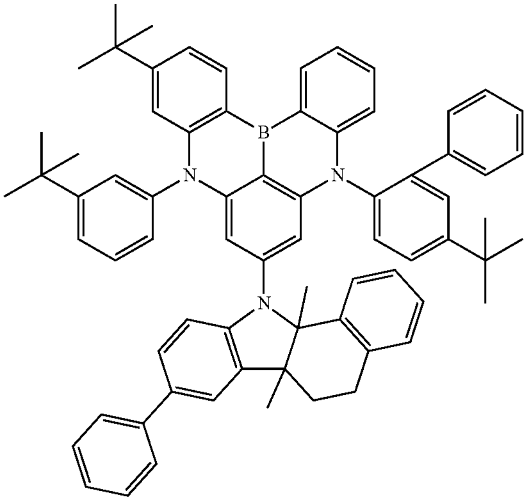

-continued
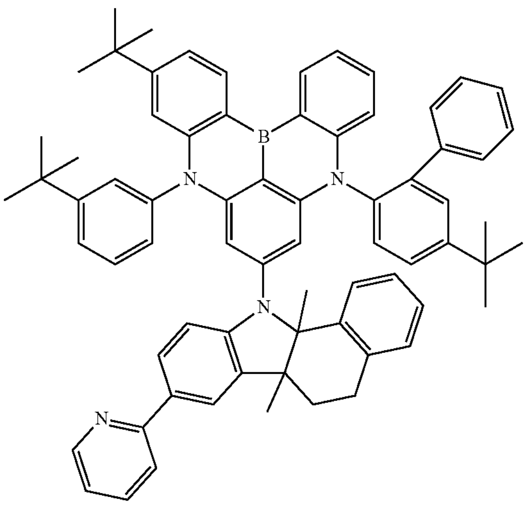
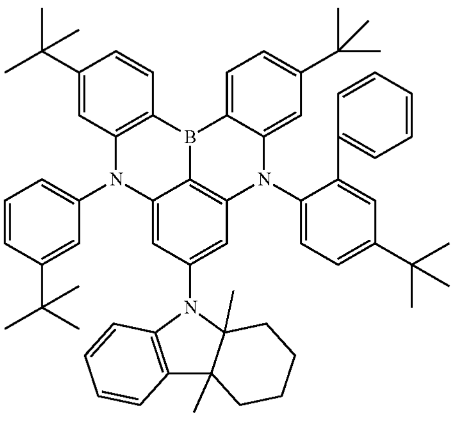
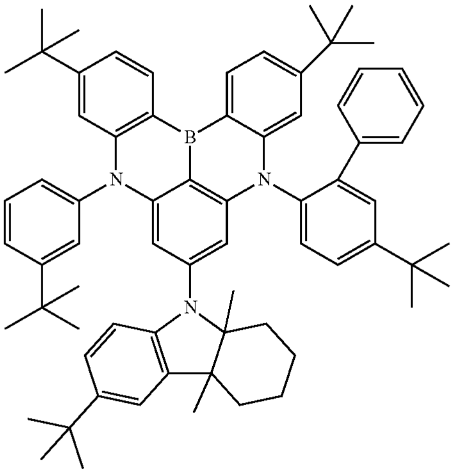
-continued
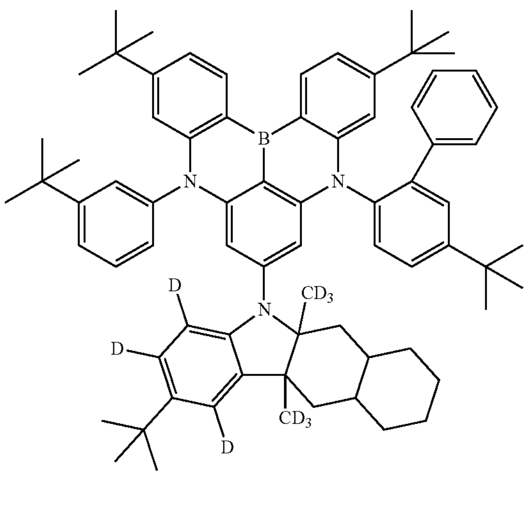
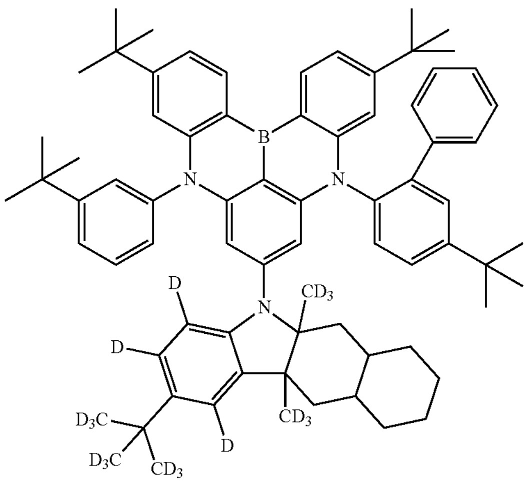
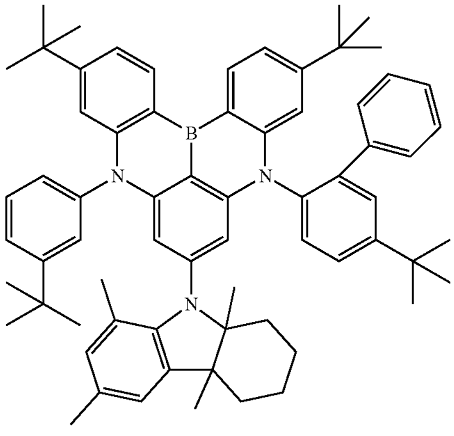

-continued
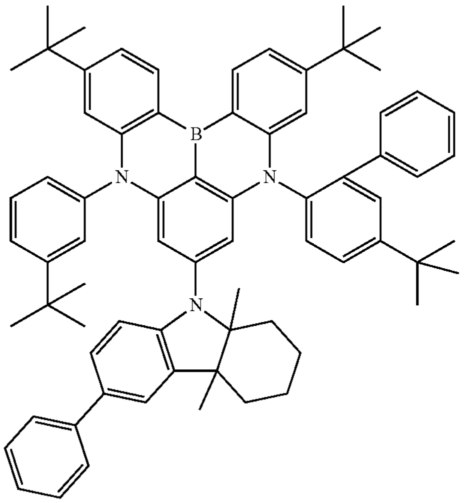
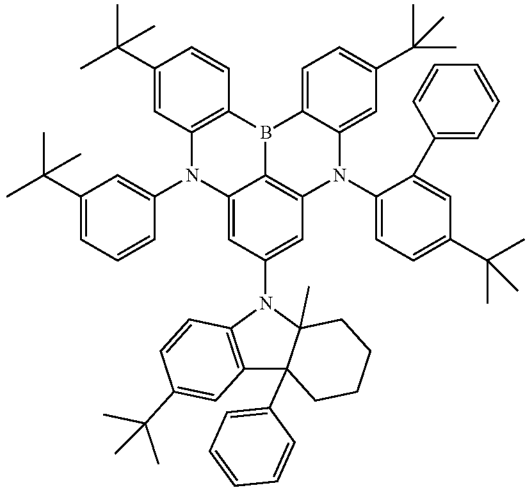
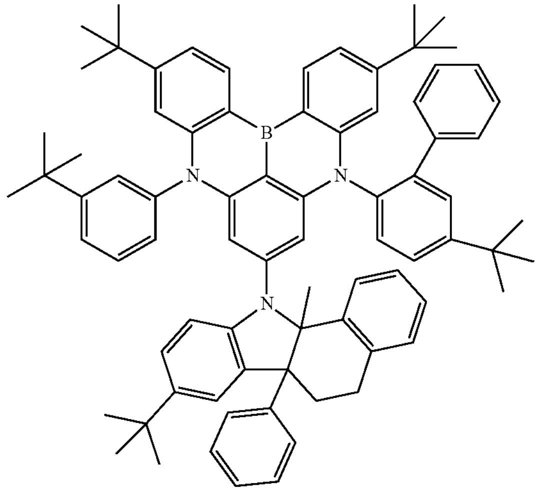
-continued
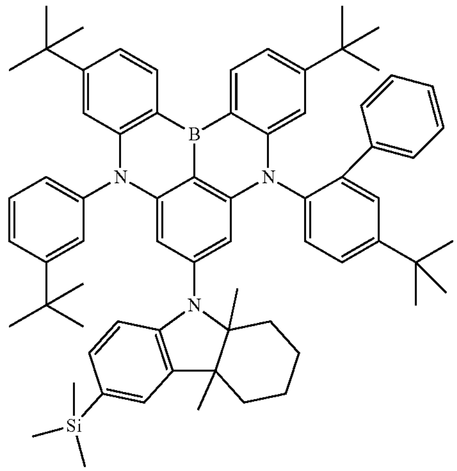
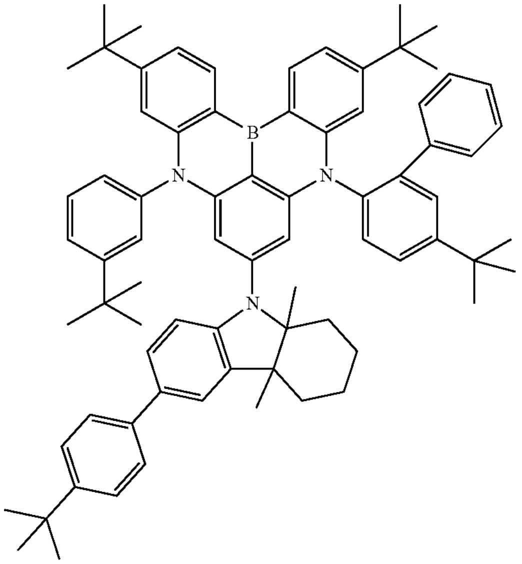
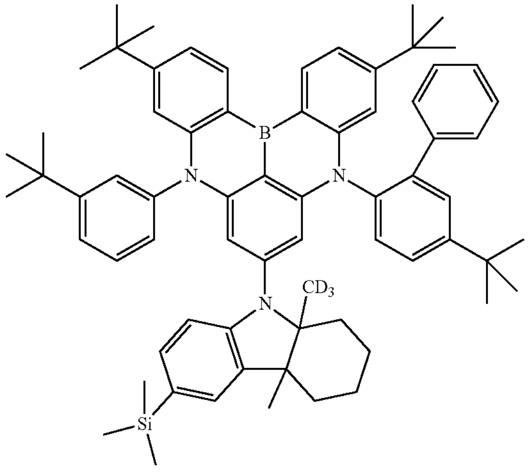

-continued
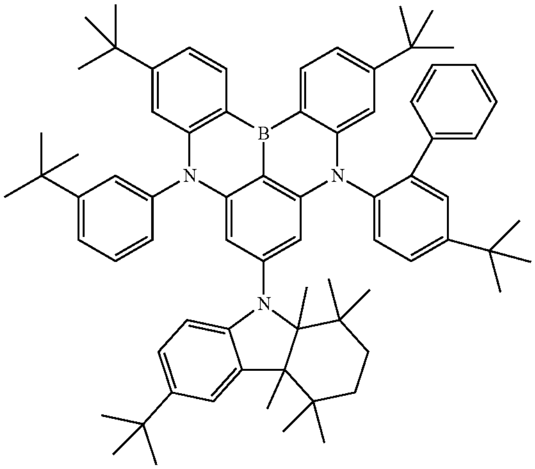
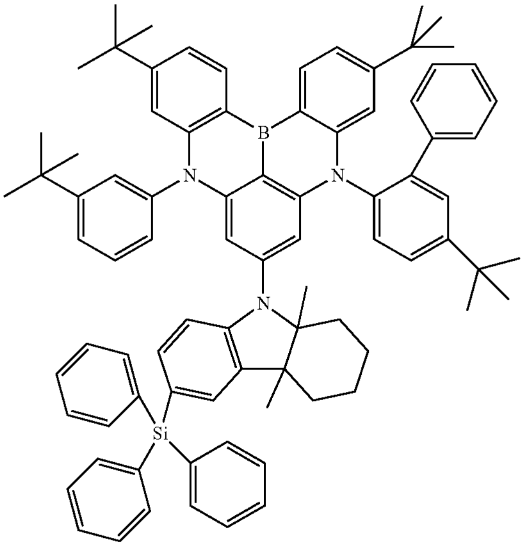
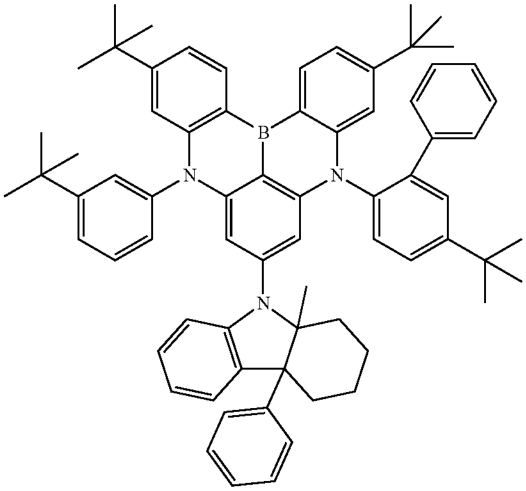
-continued
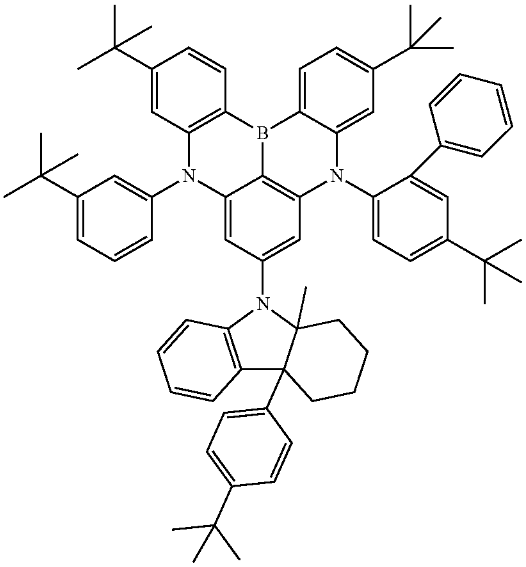
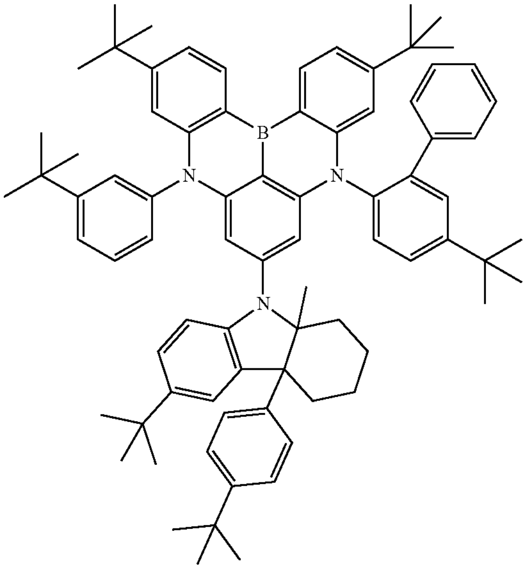
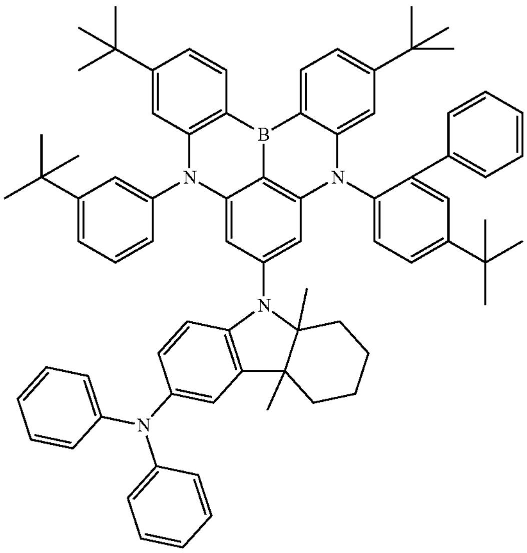

-continued
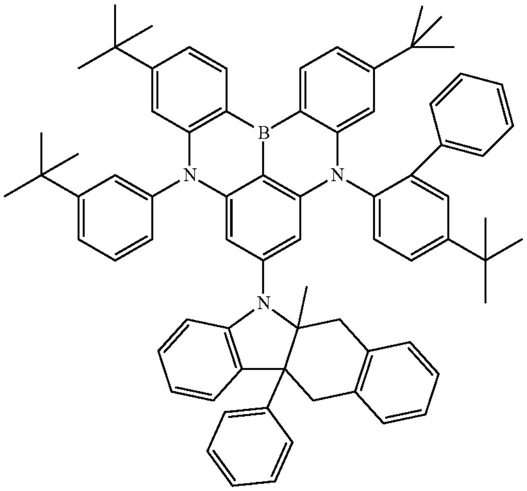
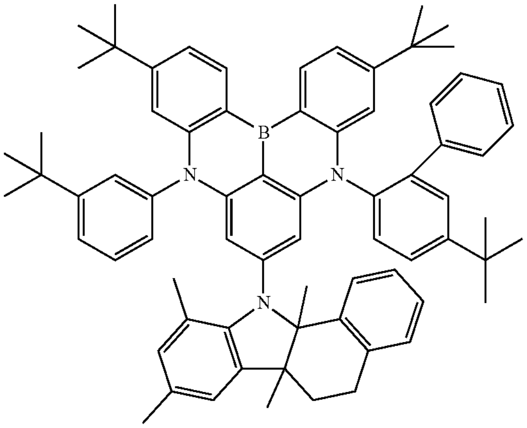
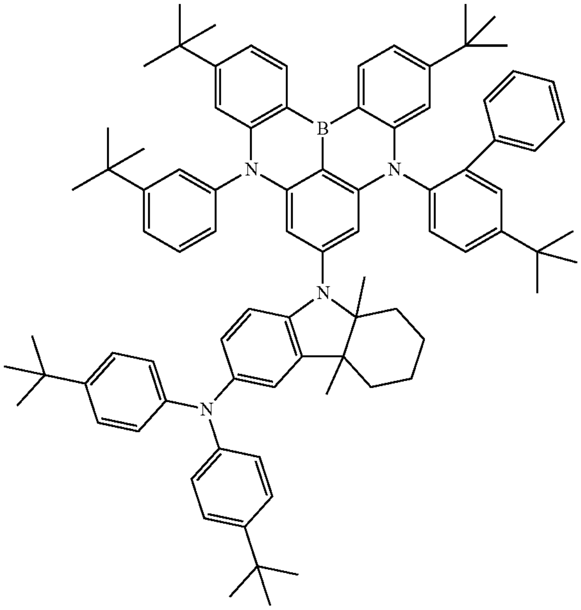
-continued
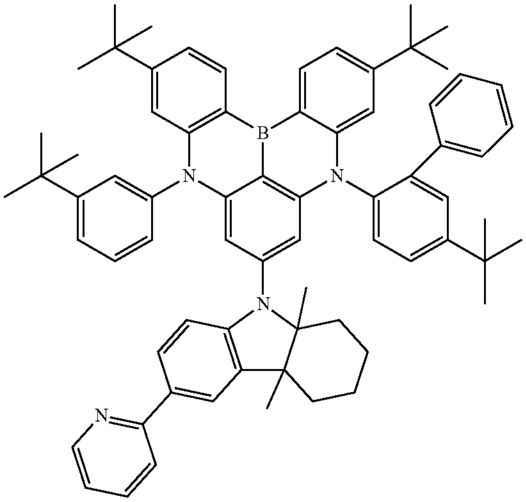
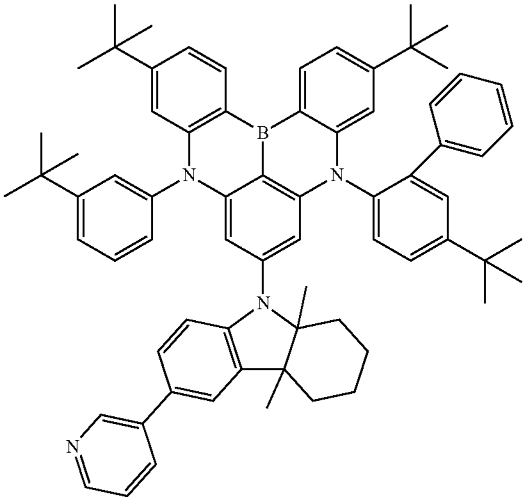
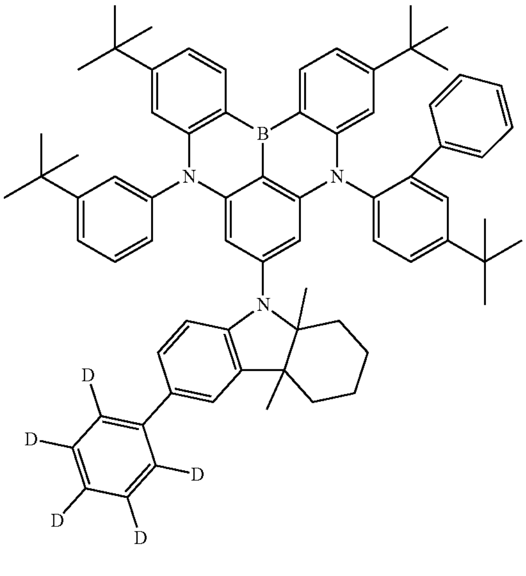

-continued
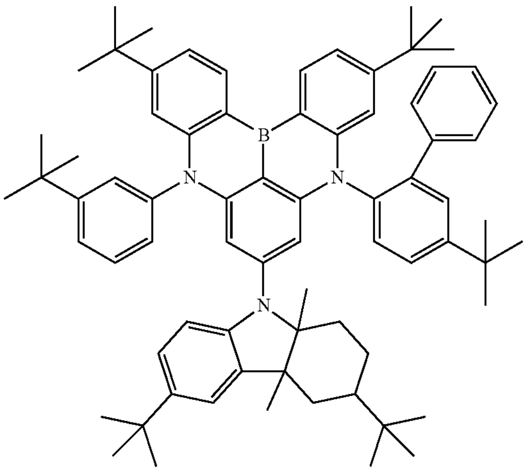
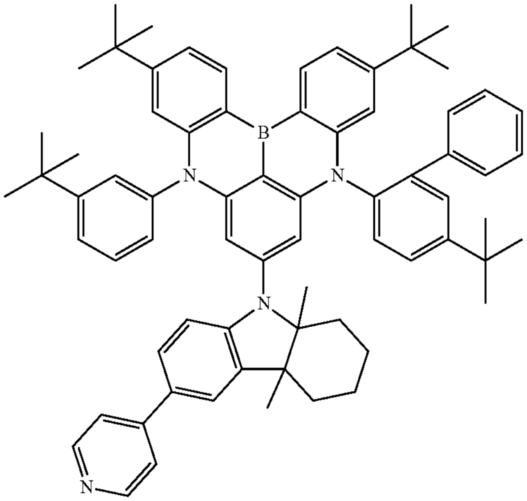
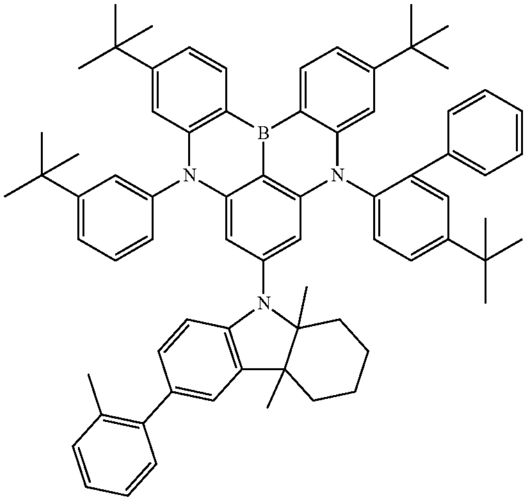
-continued
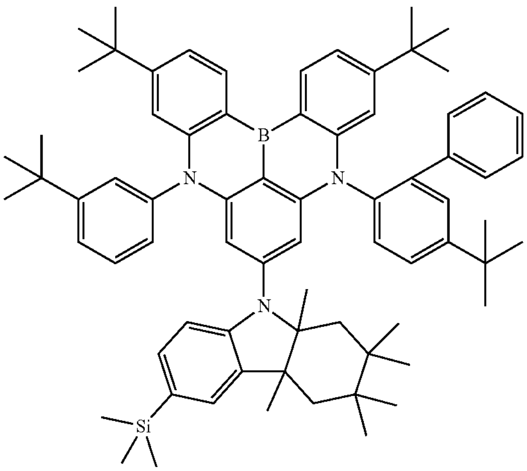
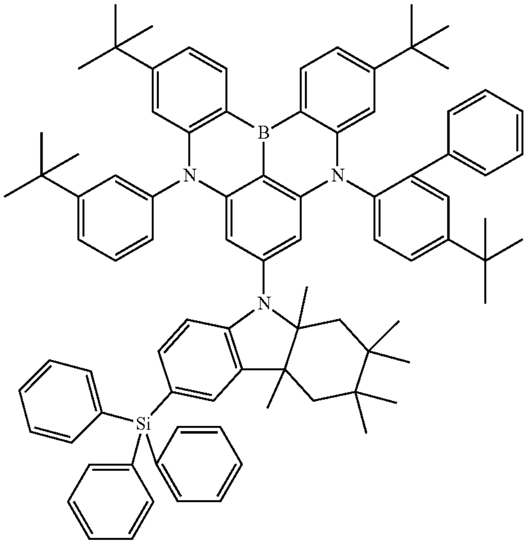
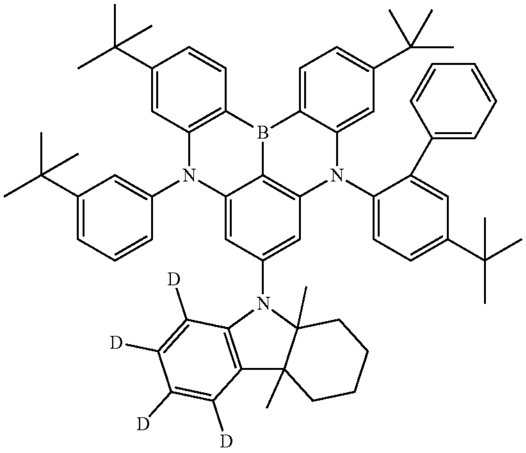

-continued
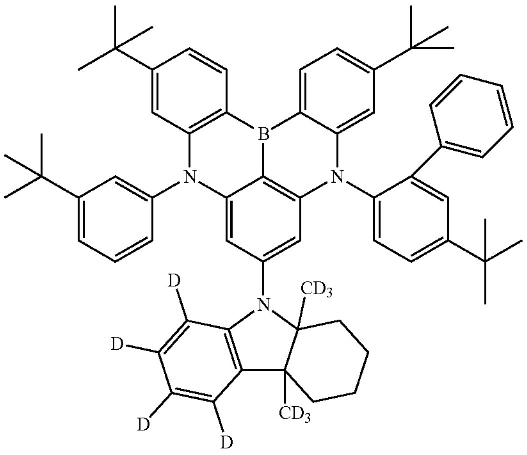
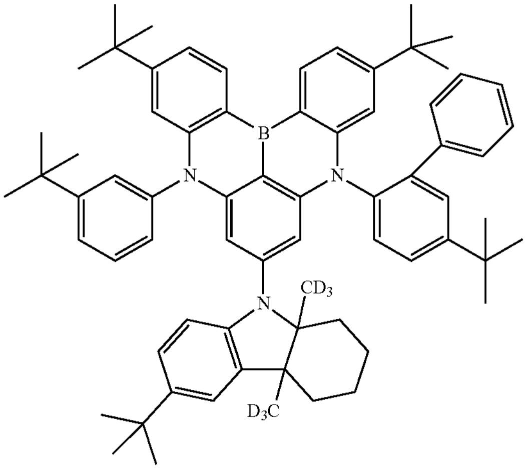
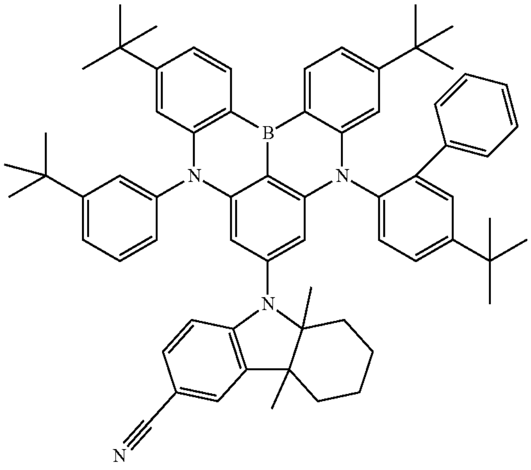
-continued
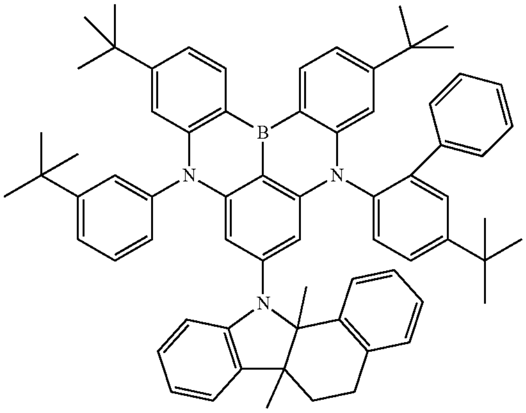
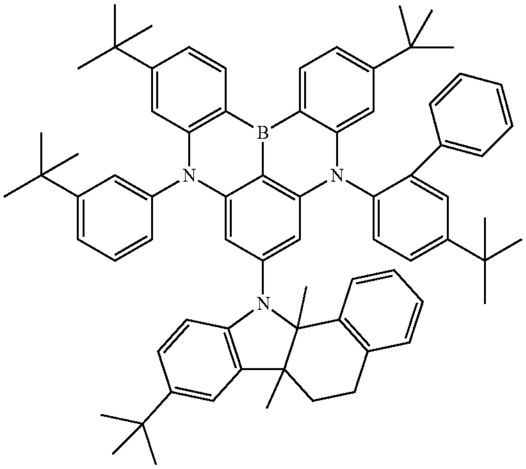
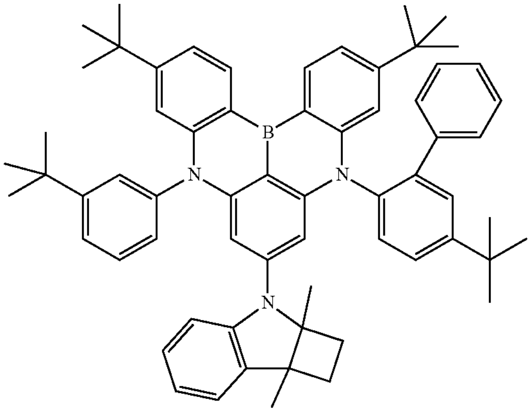
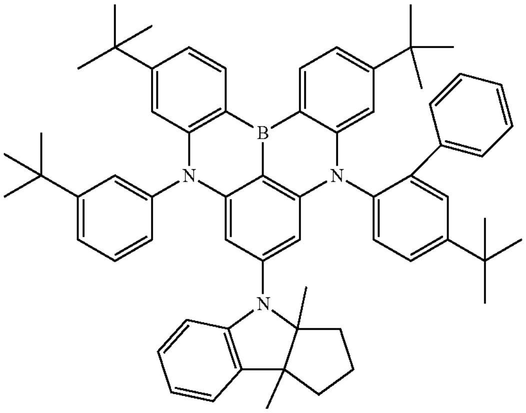

-continued
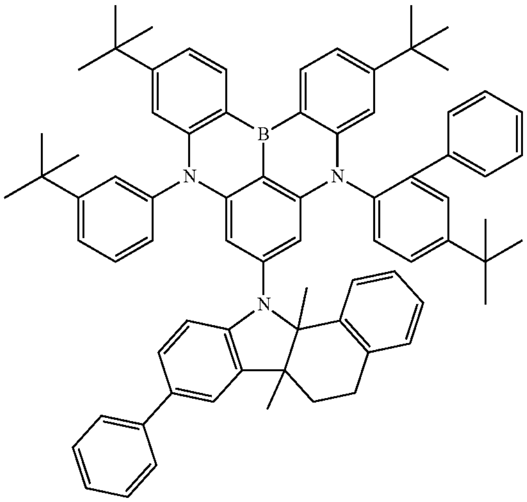
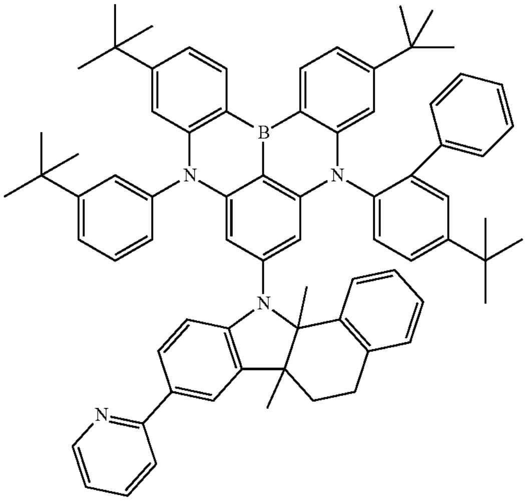
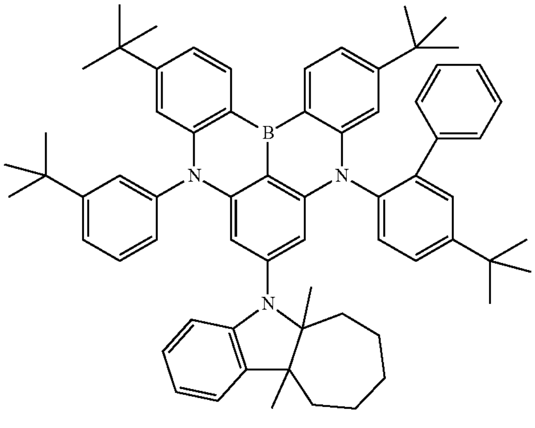
-continued
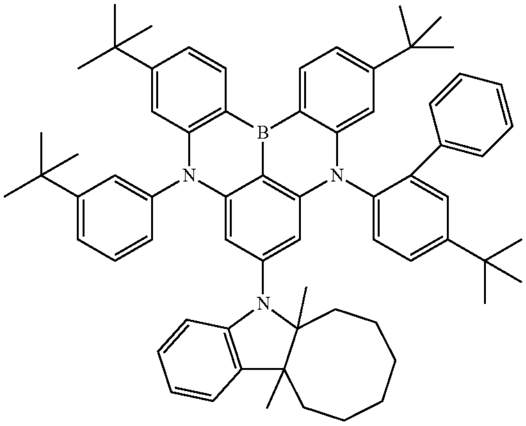
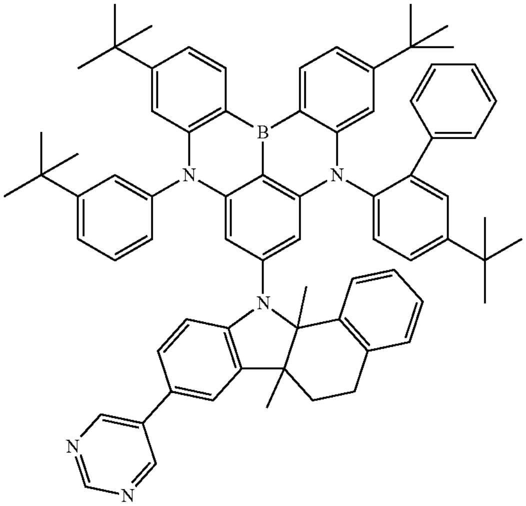
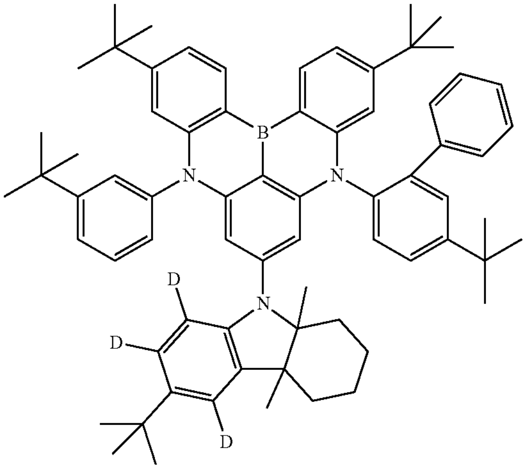

-continued
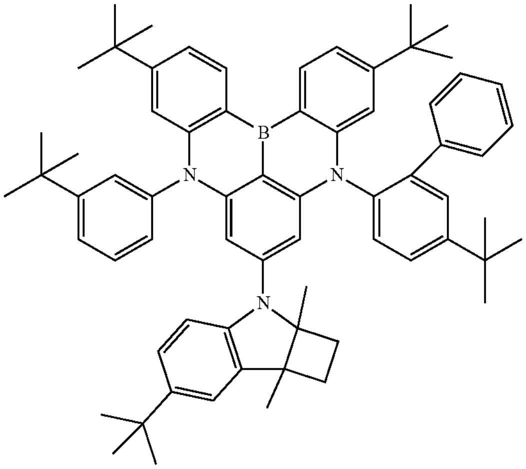
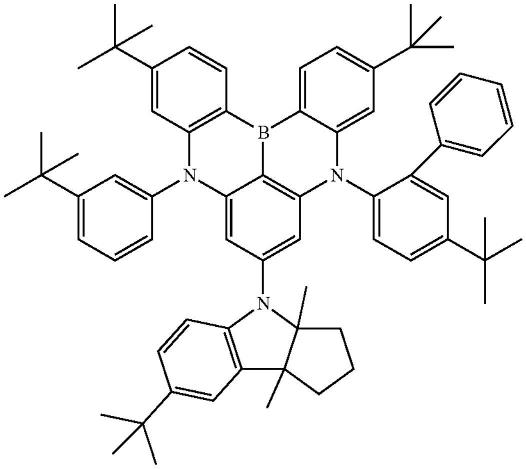
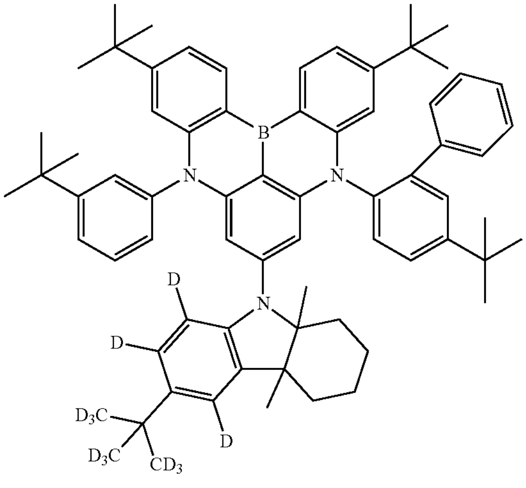
-continued
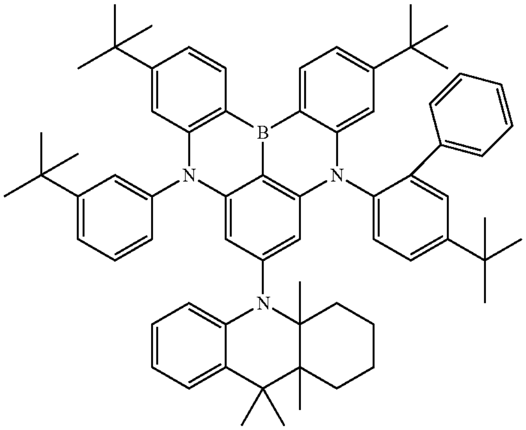
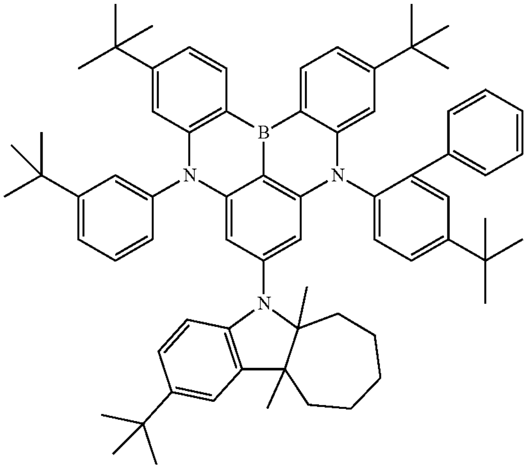
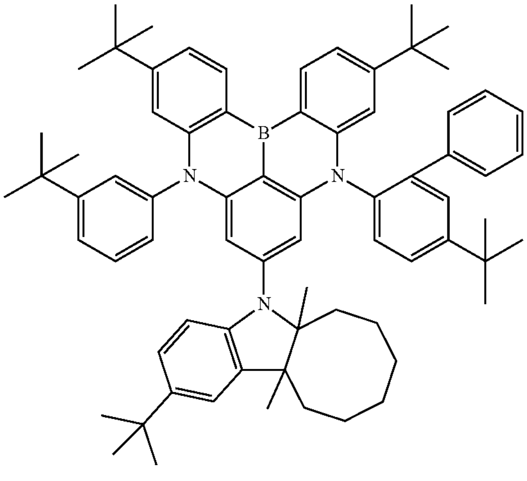

-continued
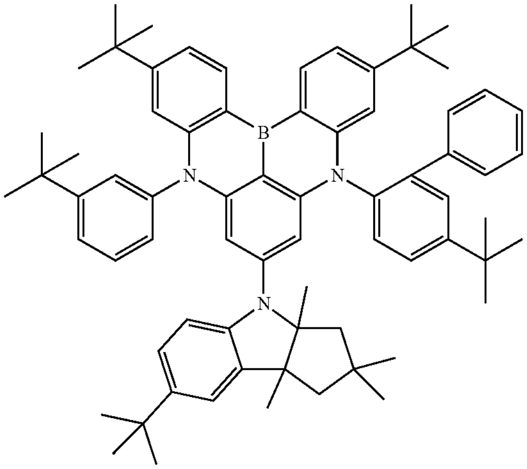
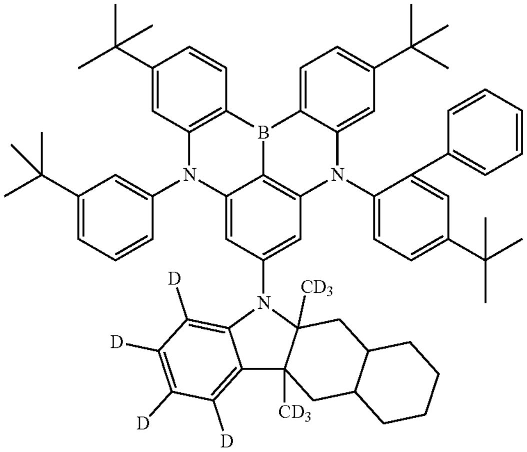
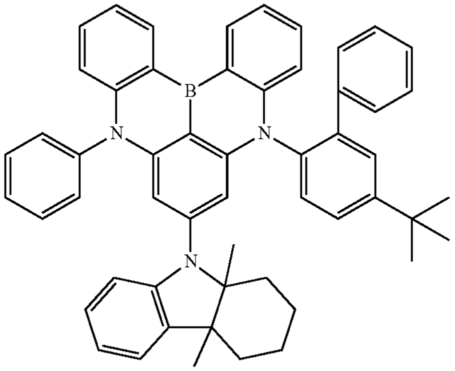
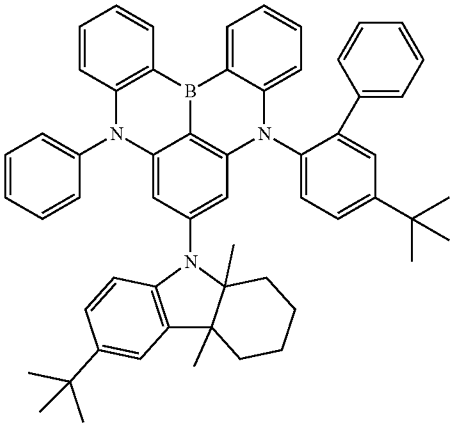
-continued
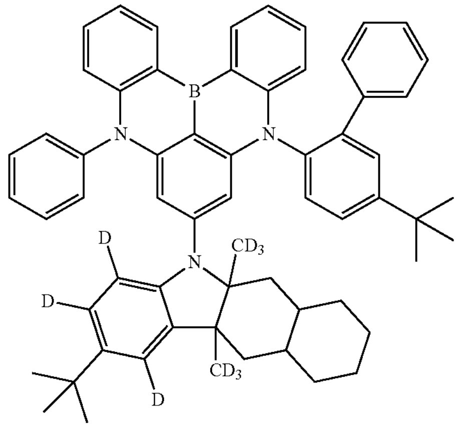
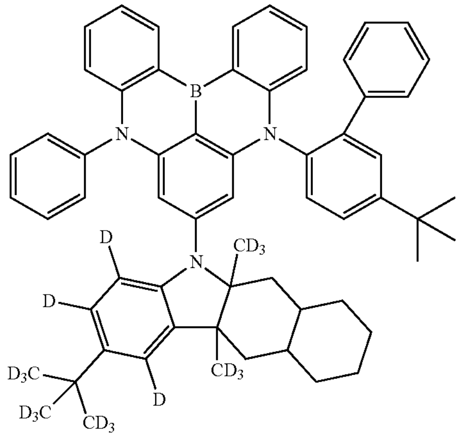
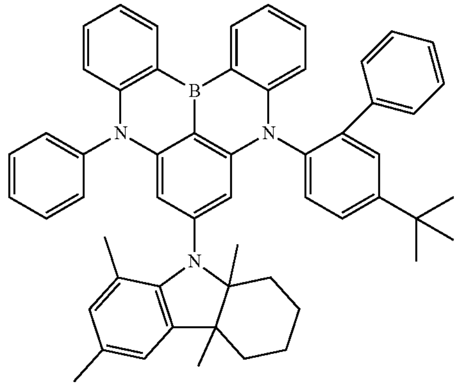
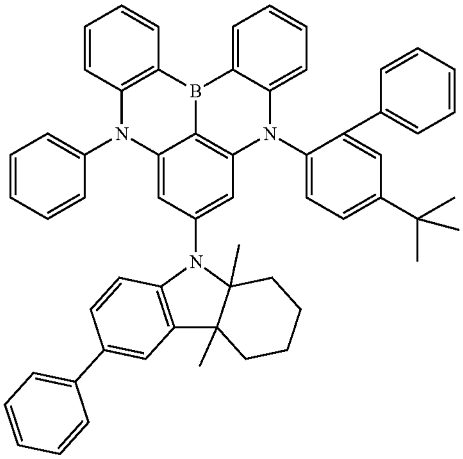

-continued
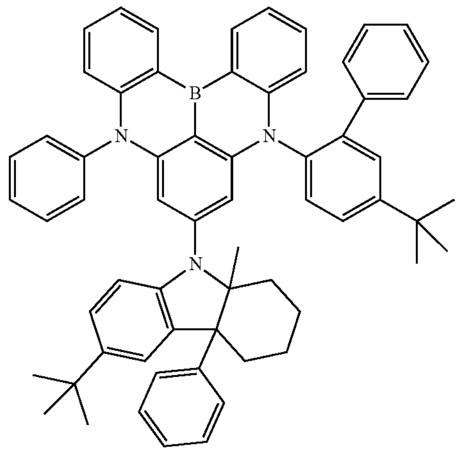
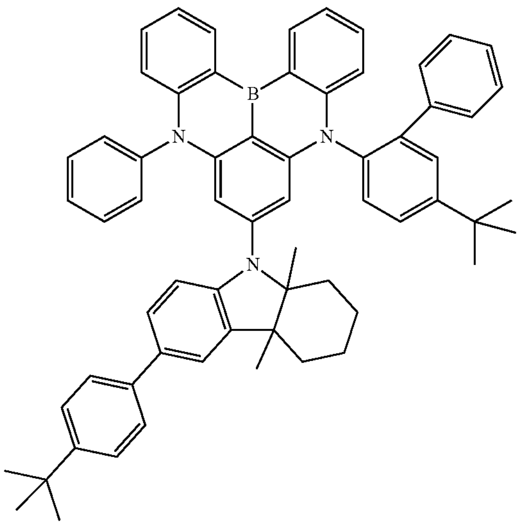
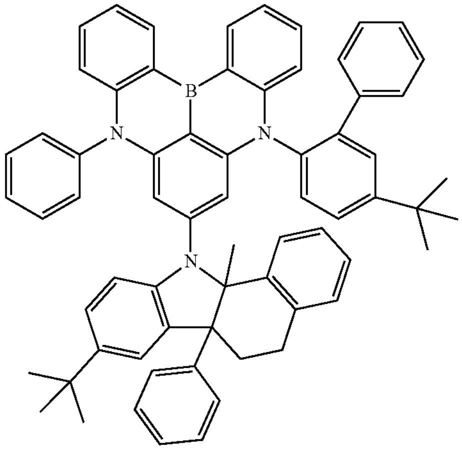
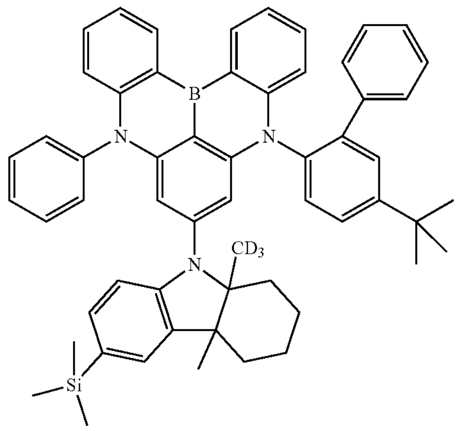
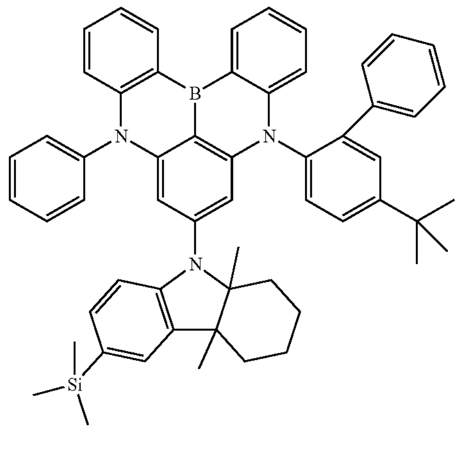
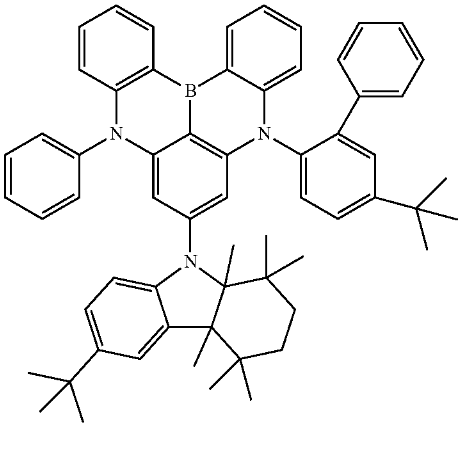

-continued
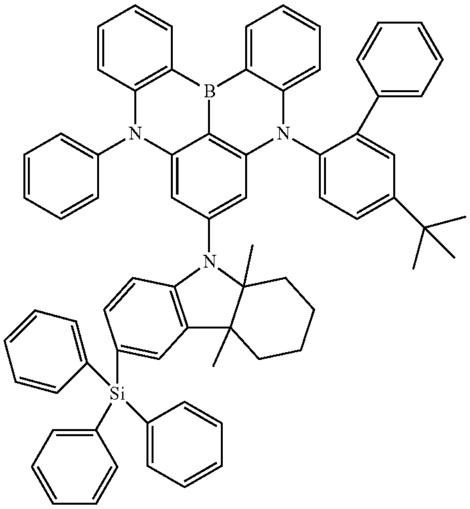
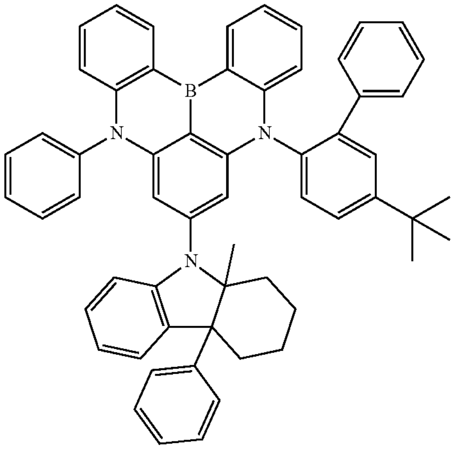
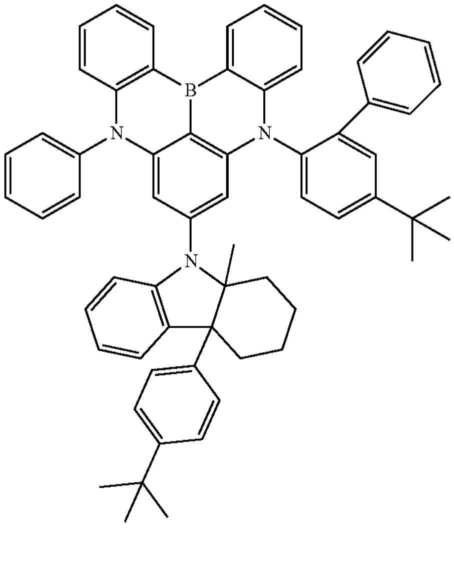
-continued
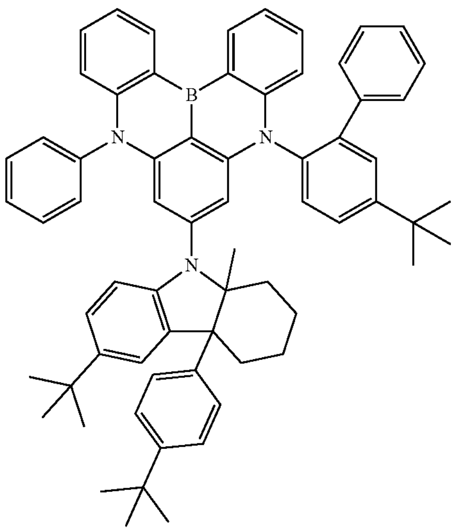
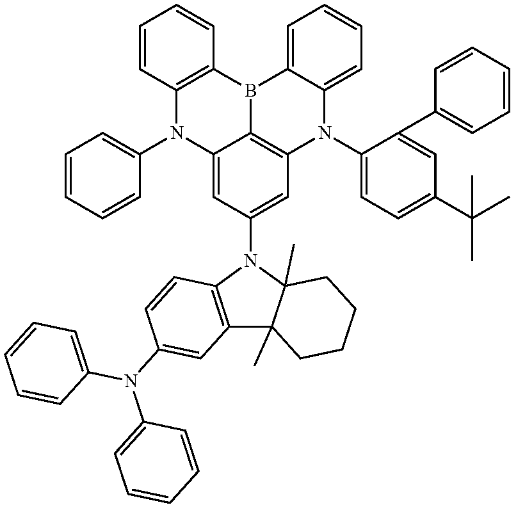
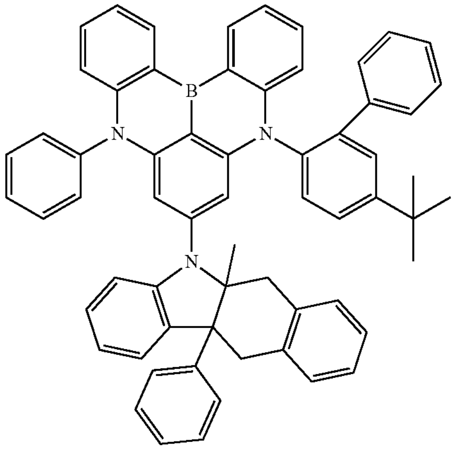

3021
-continued
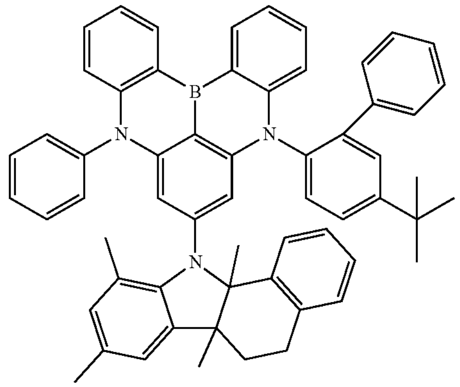
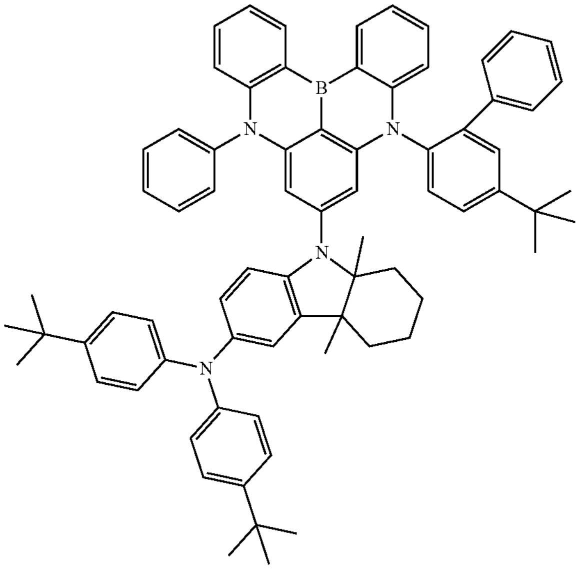
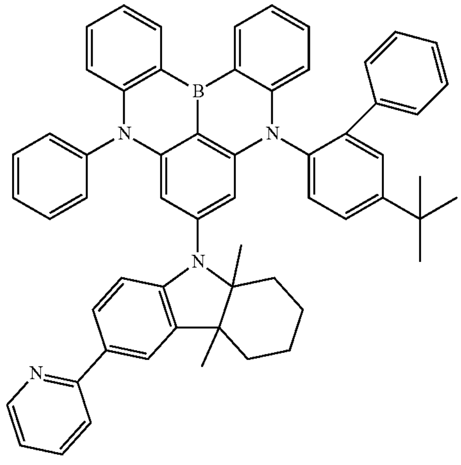
3022
-continued
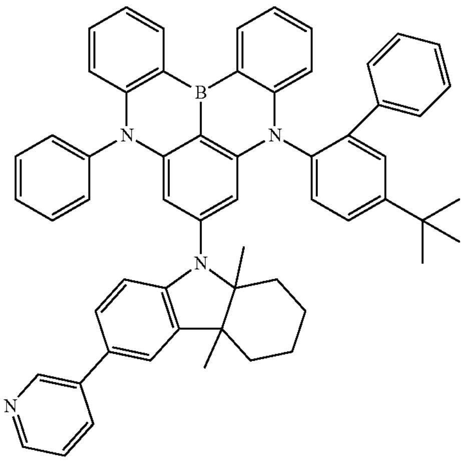
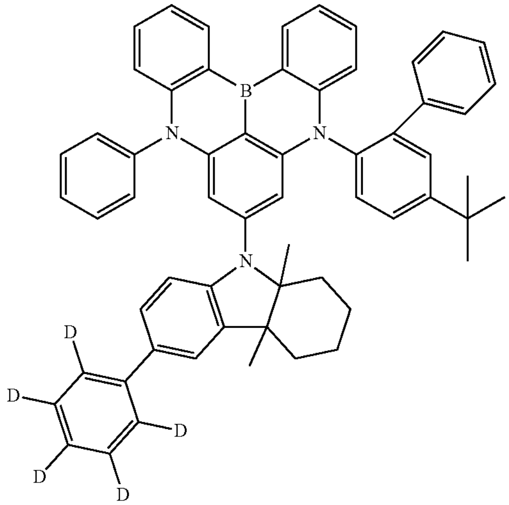
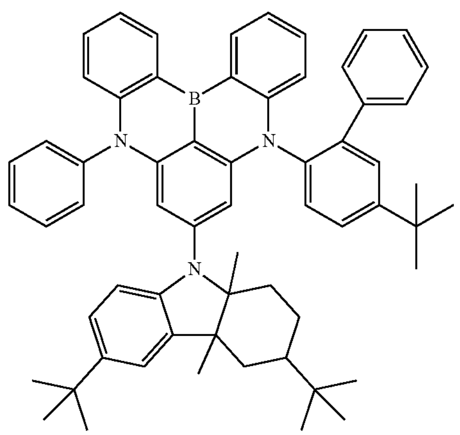

-continued
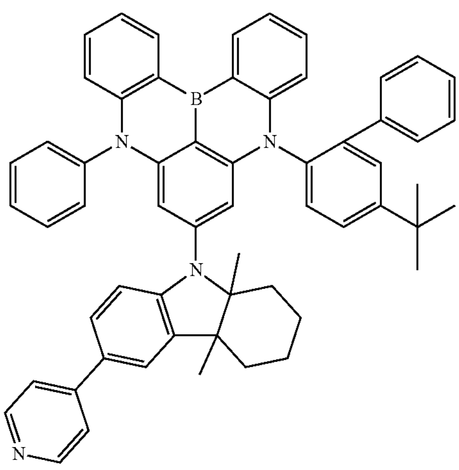
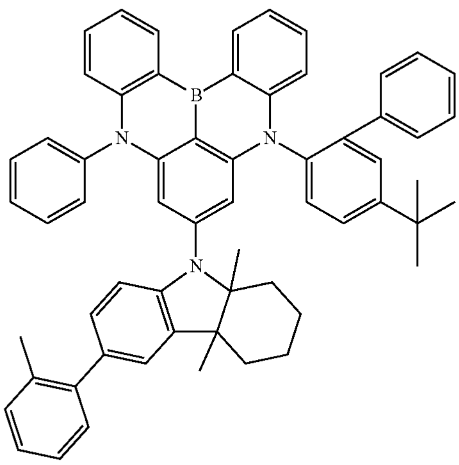
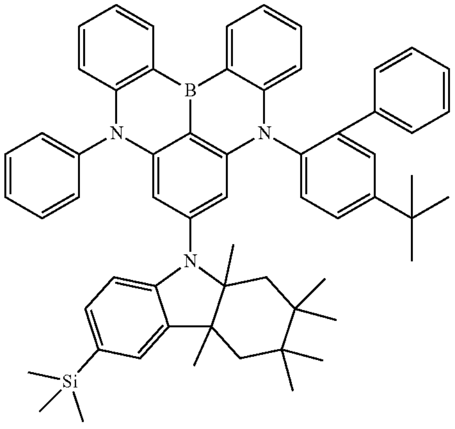
-continued
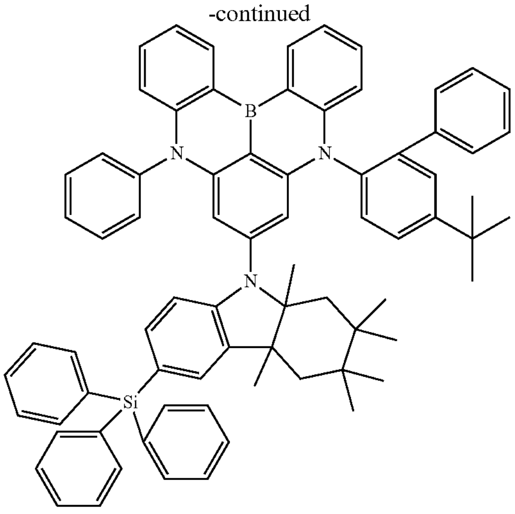
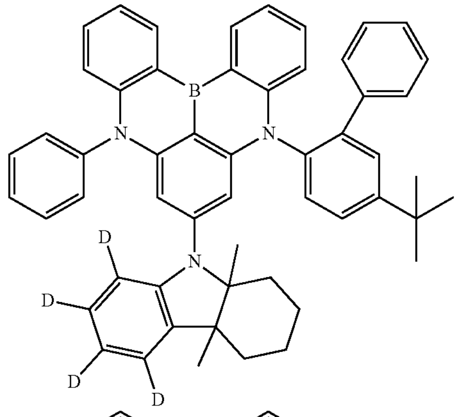
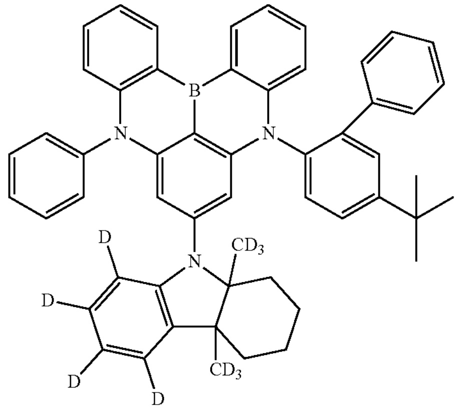
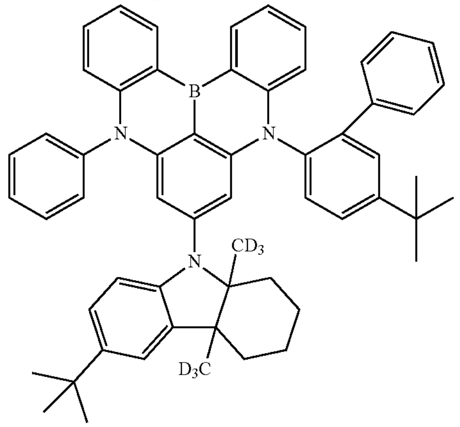

-continued
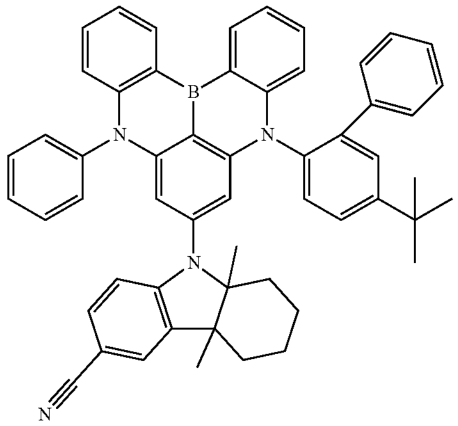
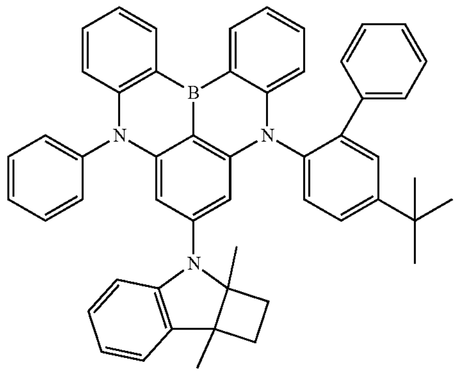
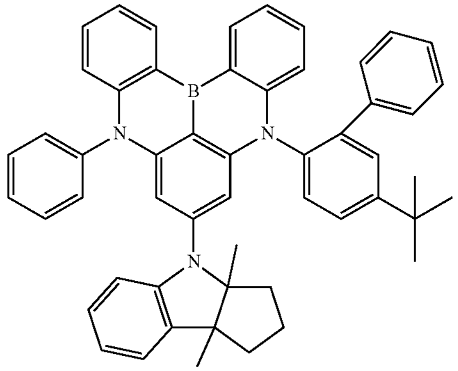
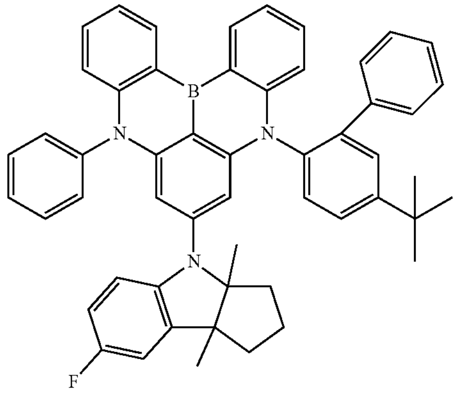
-continued
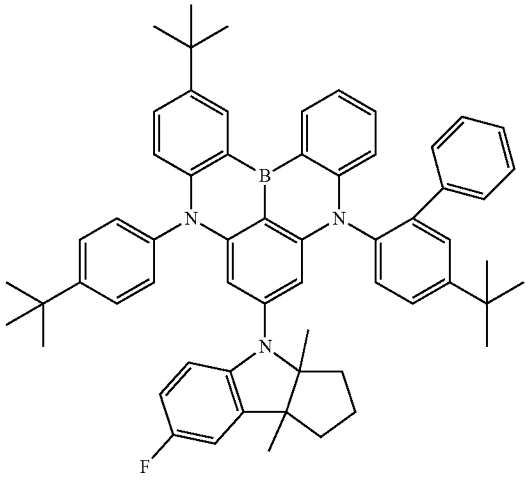
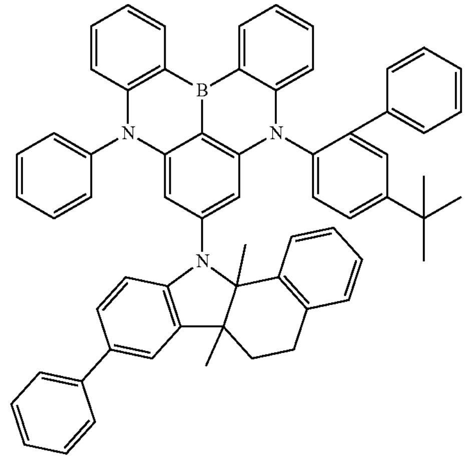
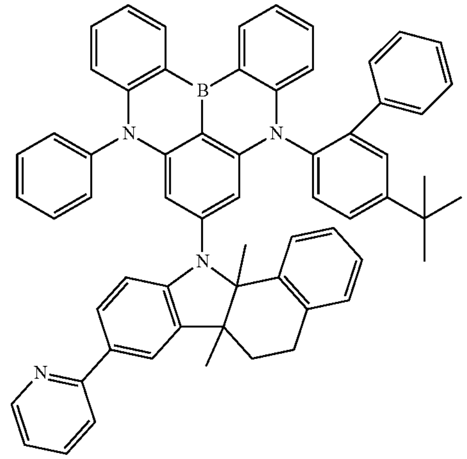

-continued
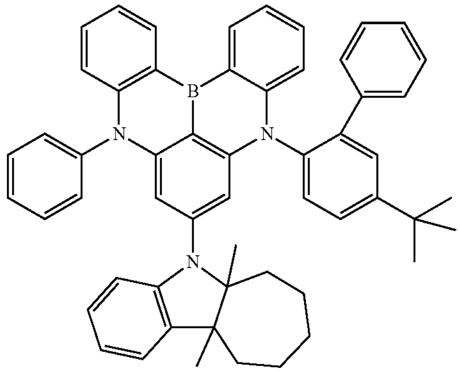
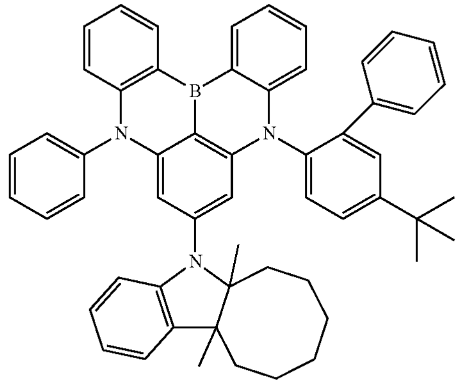
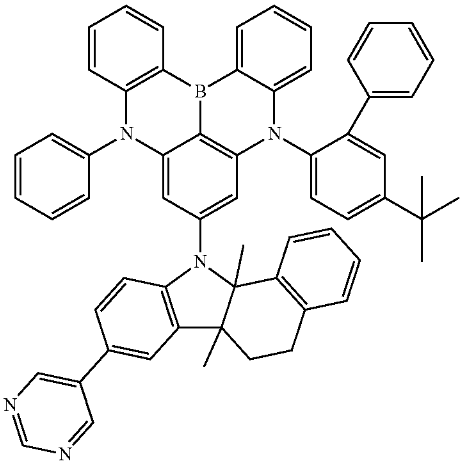
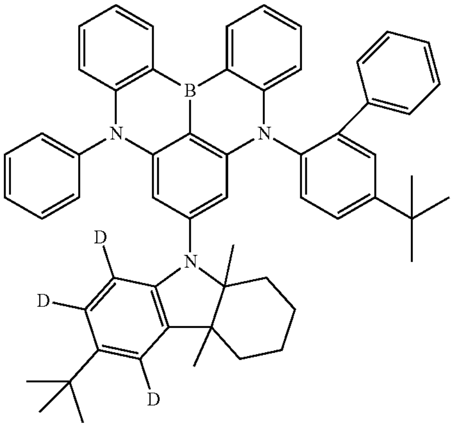
-continued
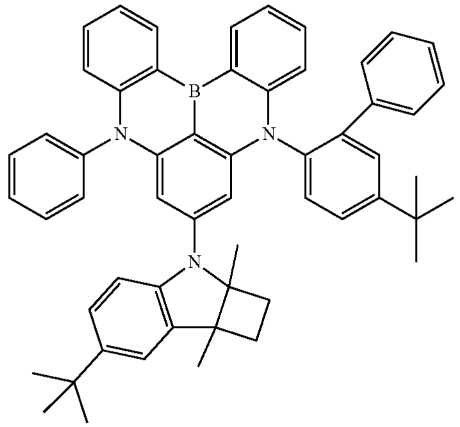
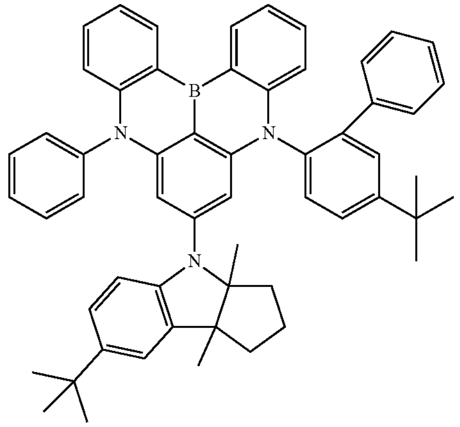
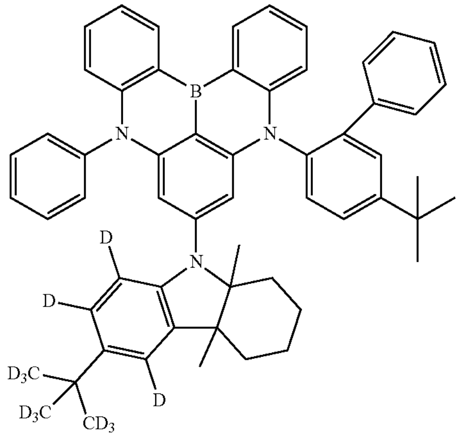
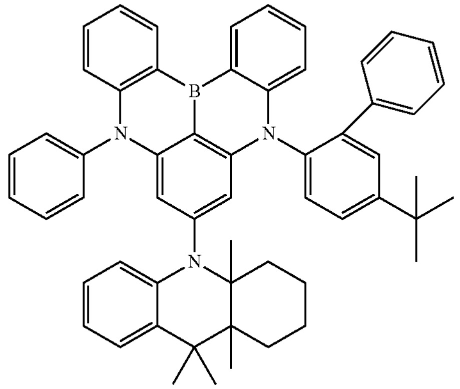

-continued
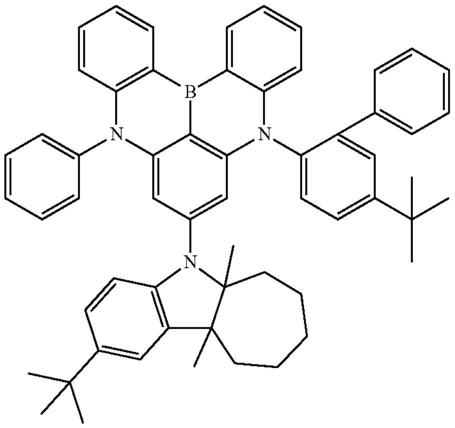
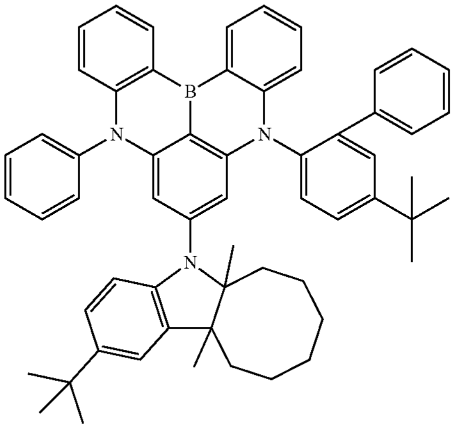
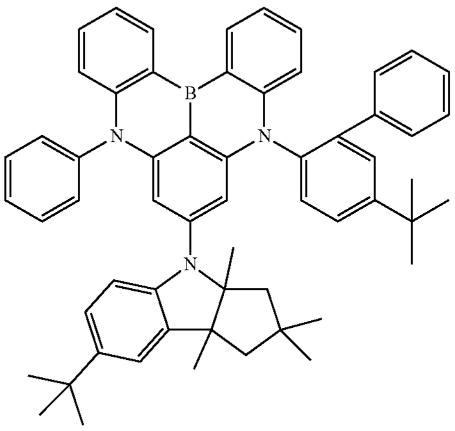
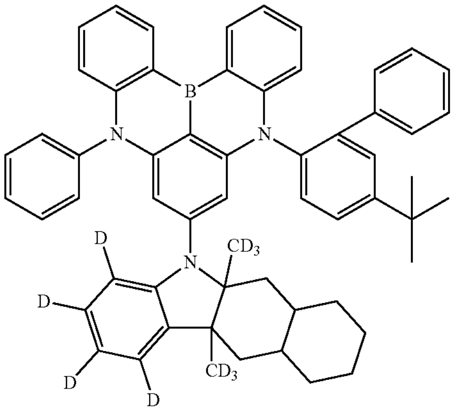
-continued
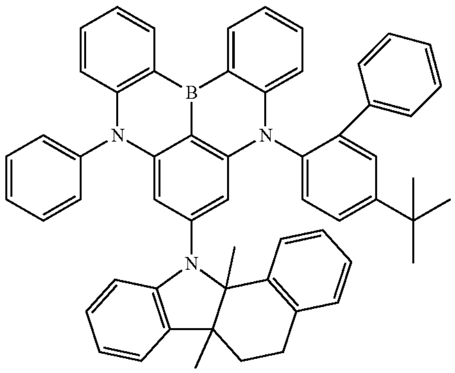
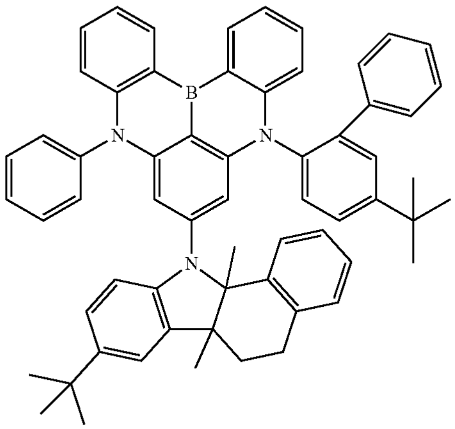
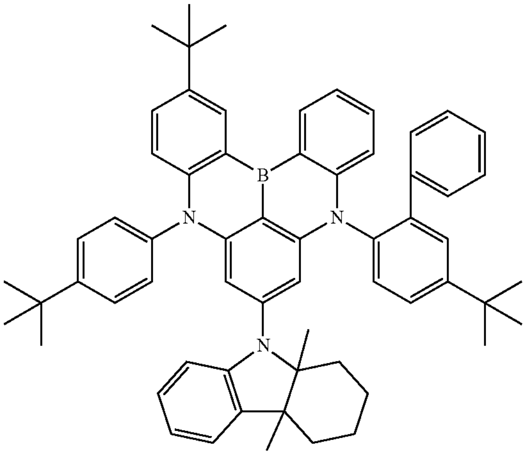

-continued
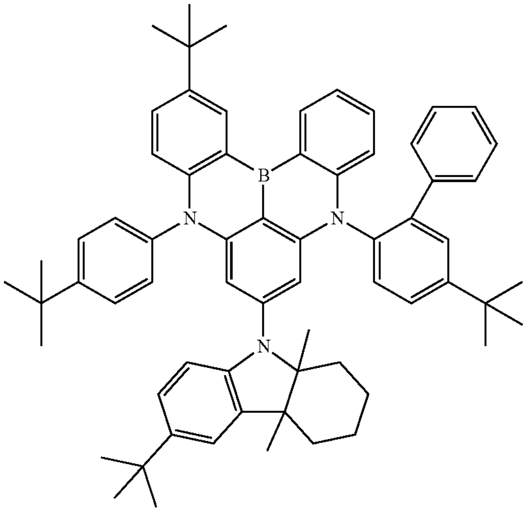
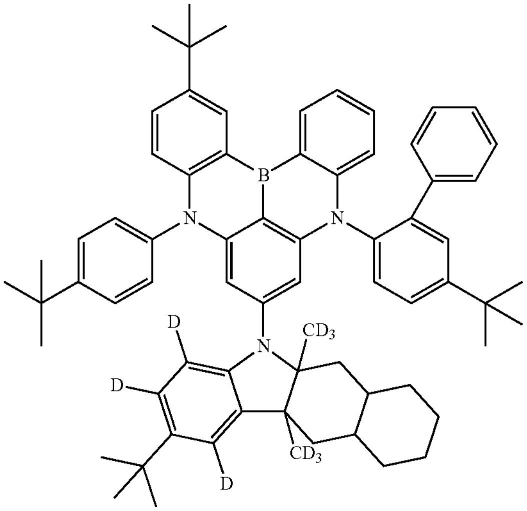
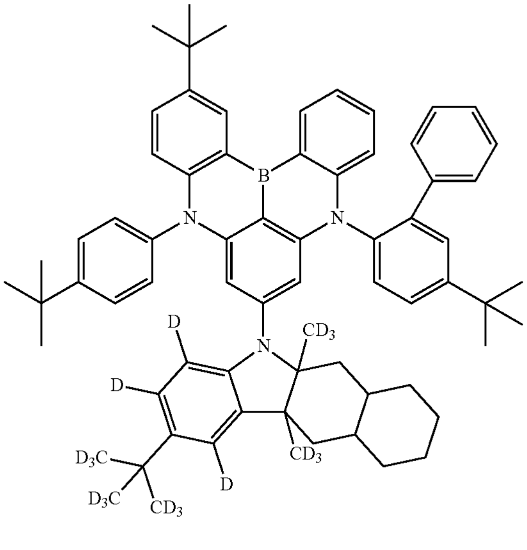
-continued
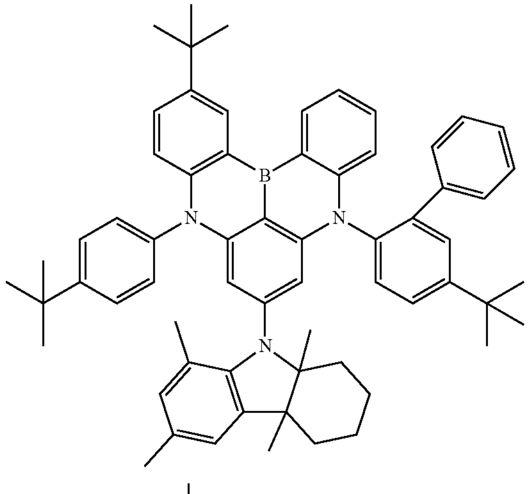
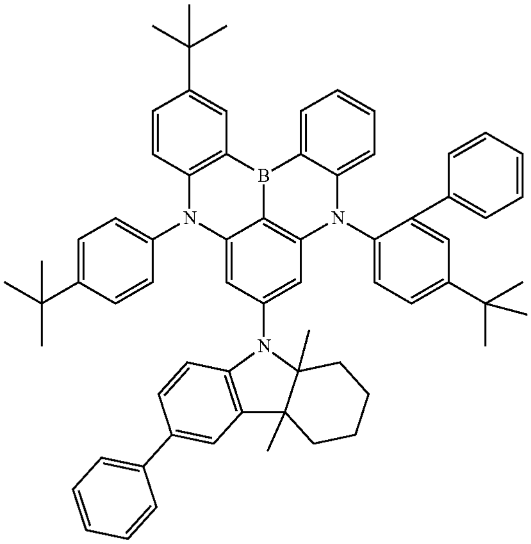
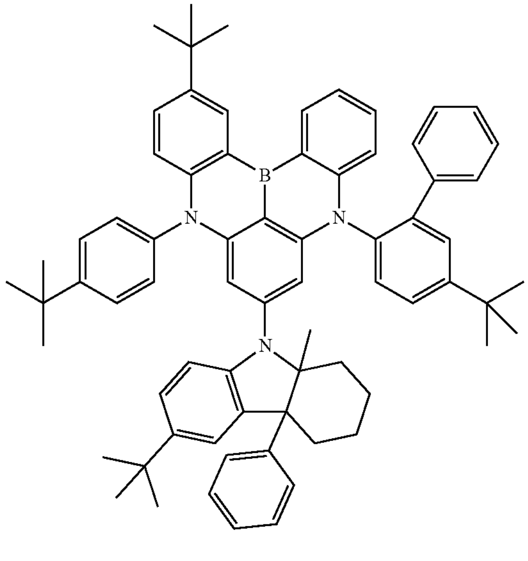

-continued
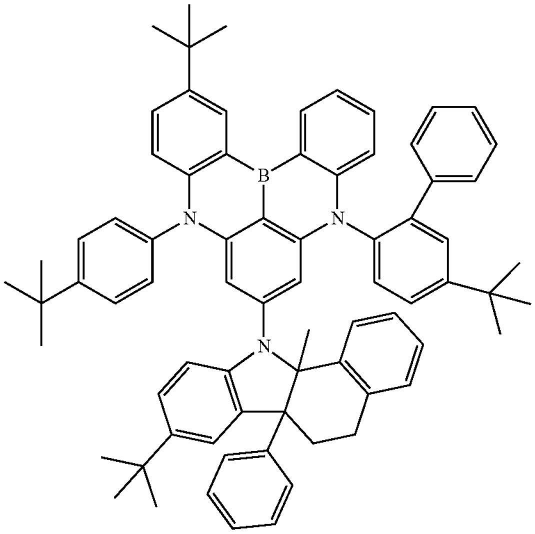
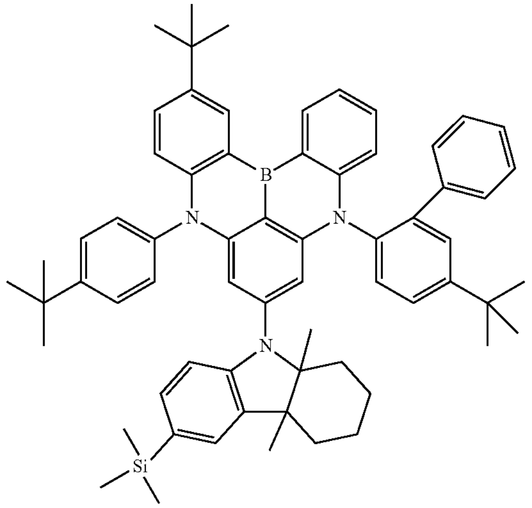
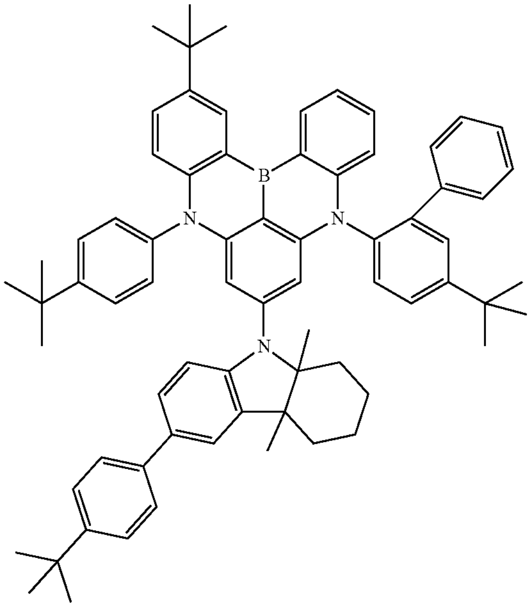
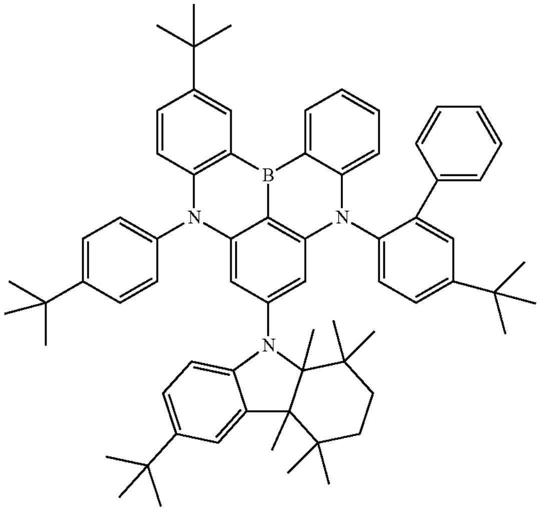
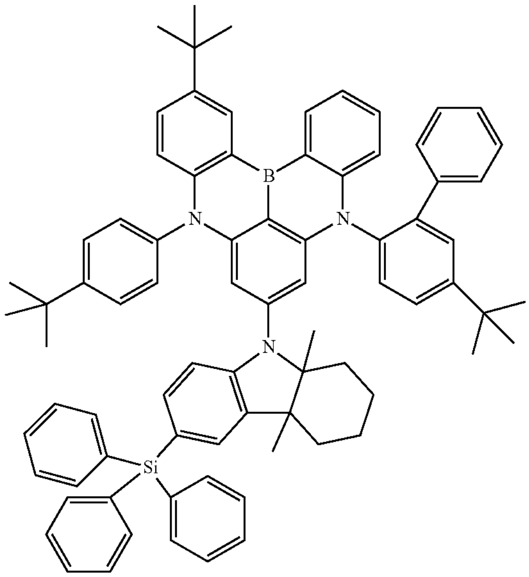
-continued
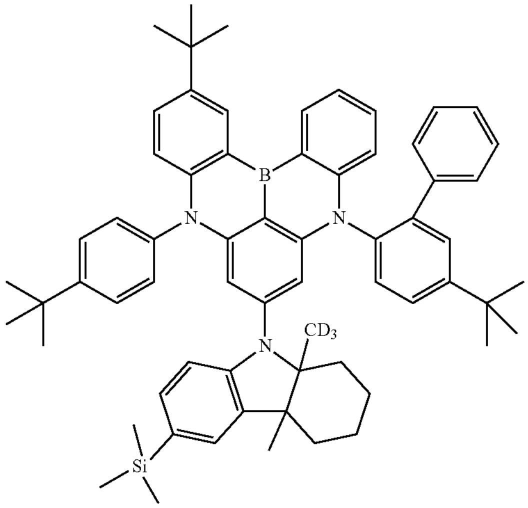

-continued
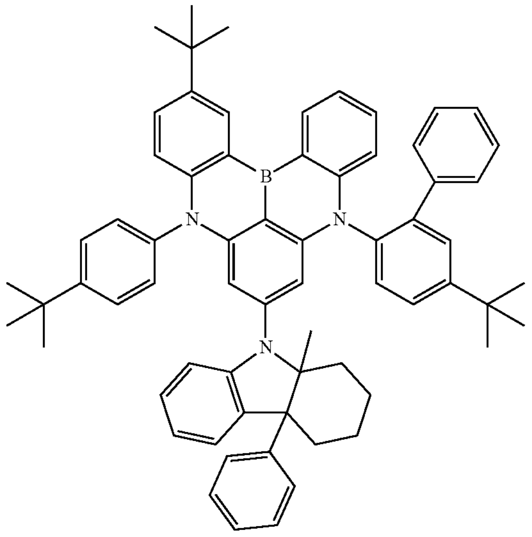
-continued
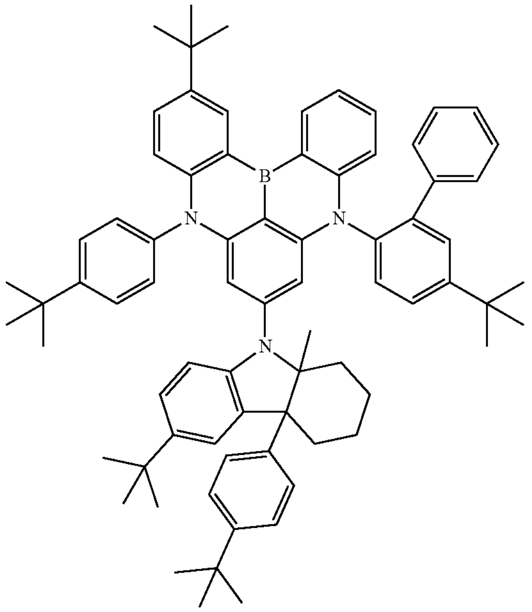
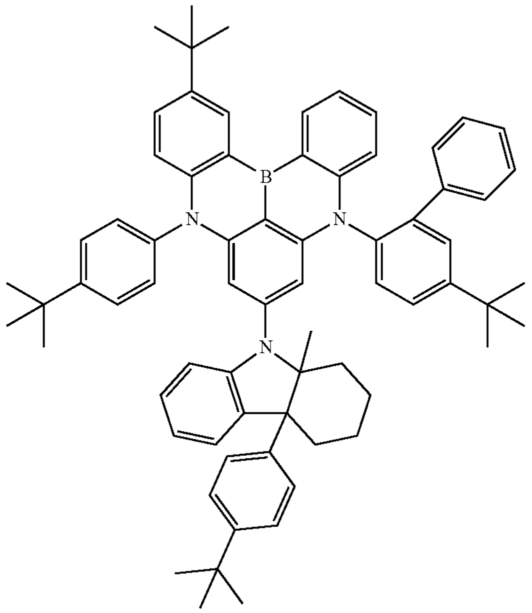
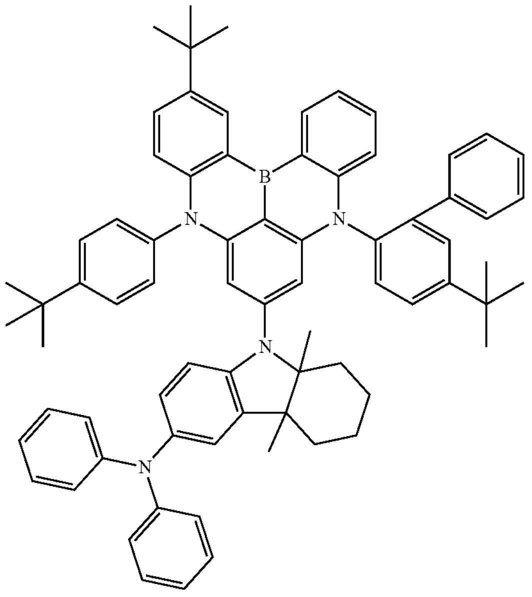

-continued
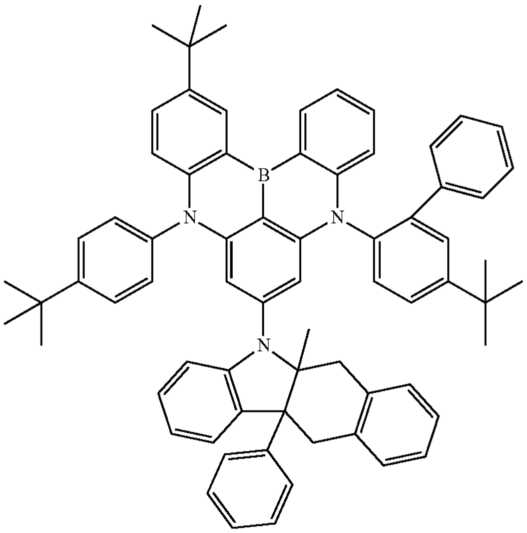
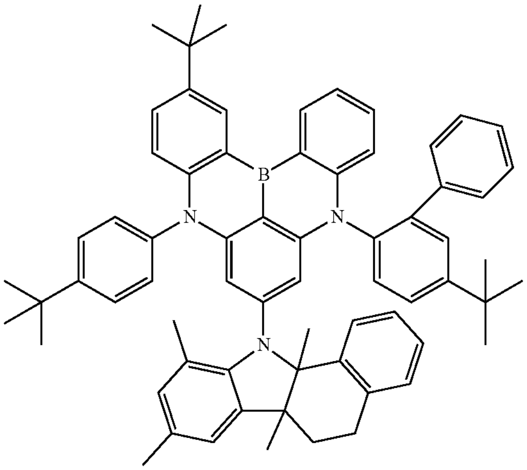
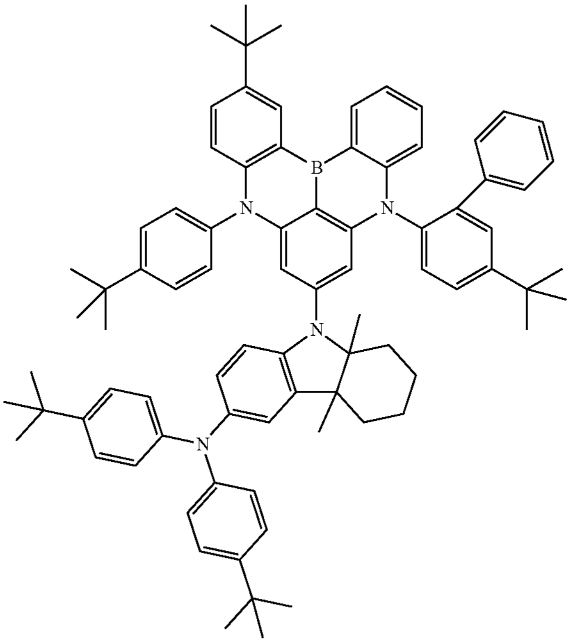
-continued
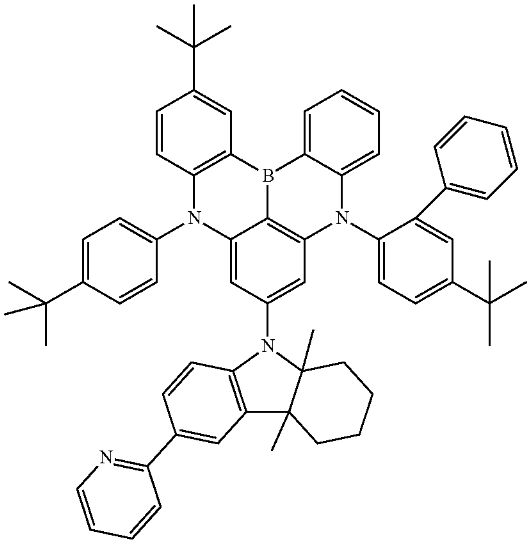
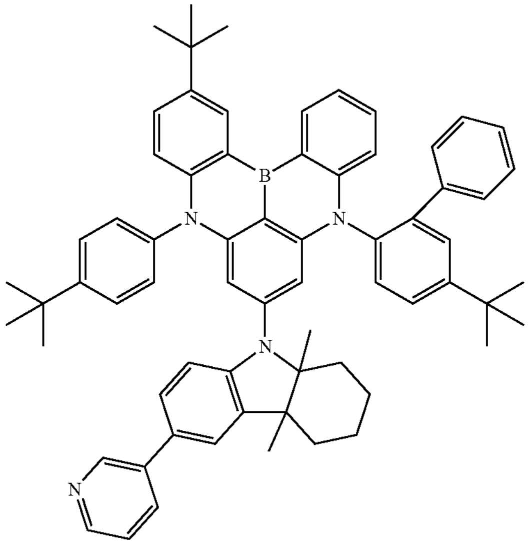
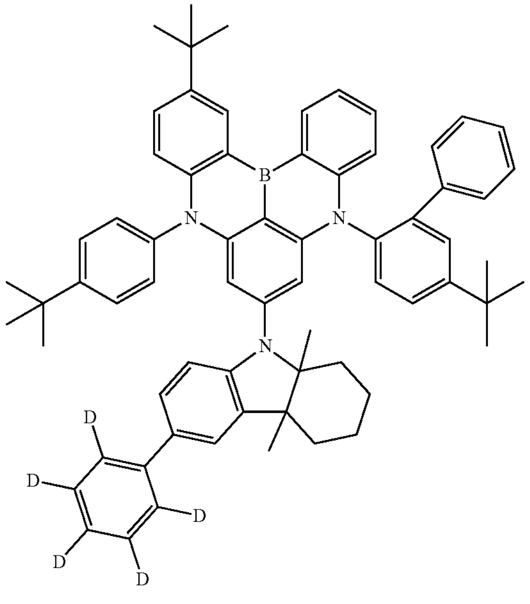

-continued
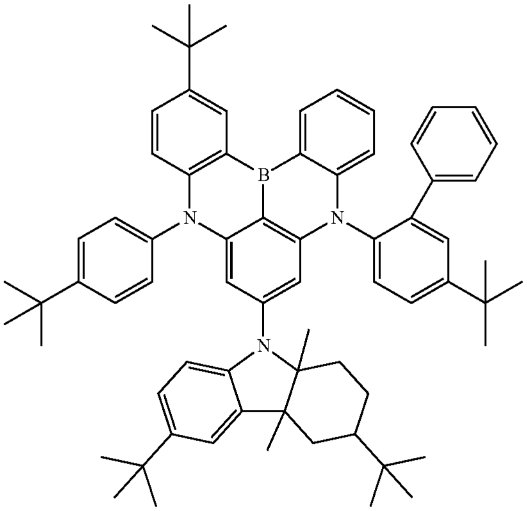
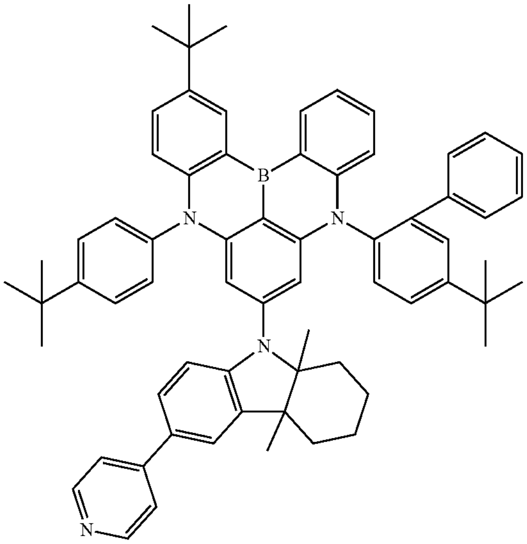
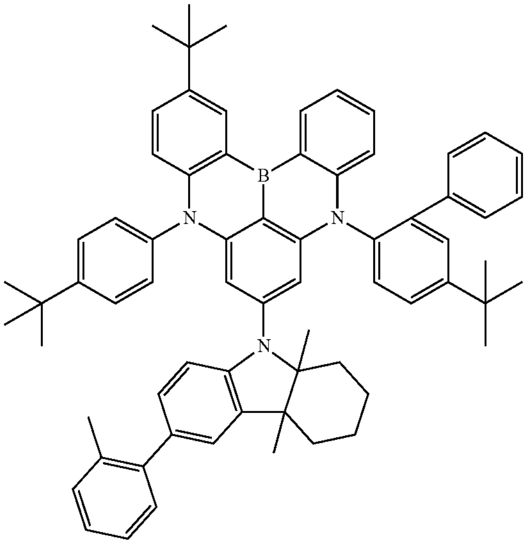
-continued
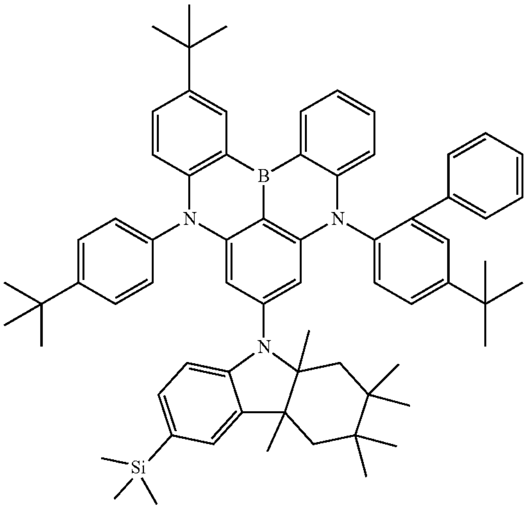
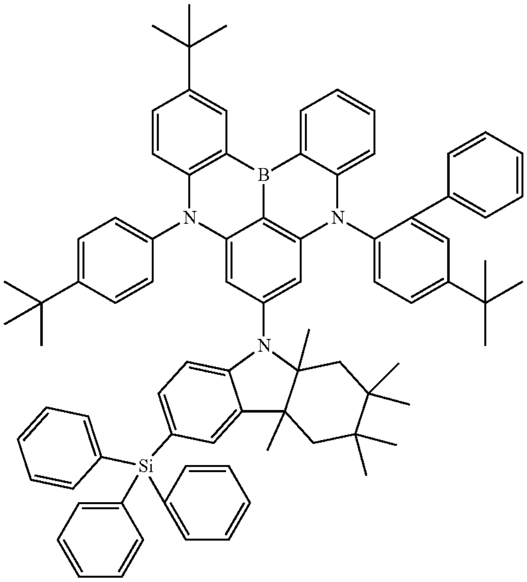
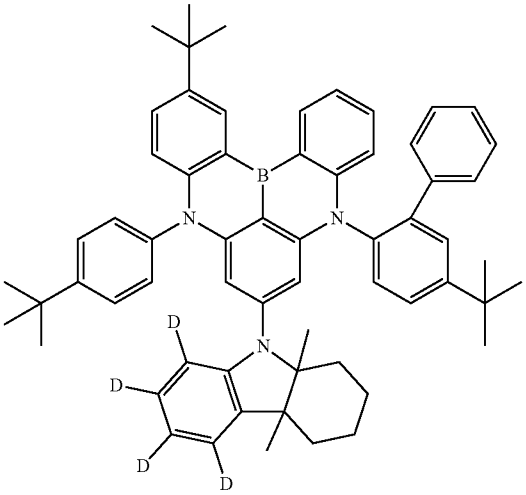

-continued
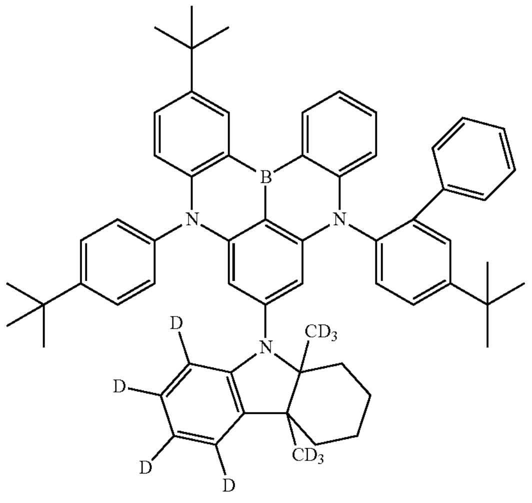
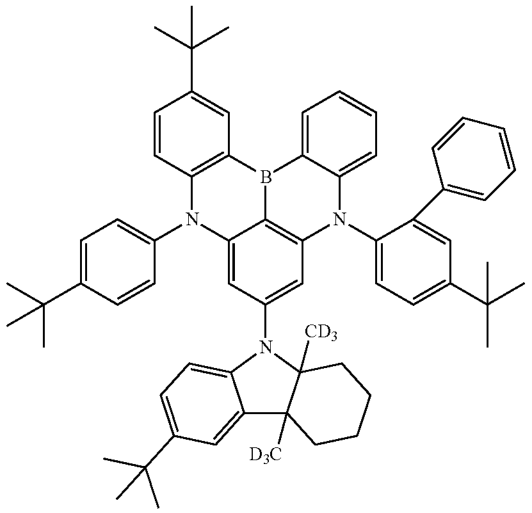
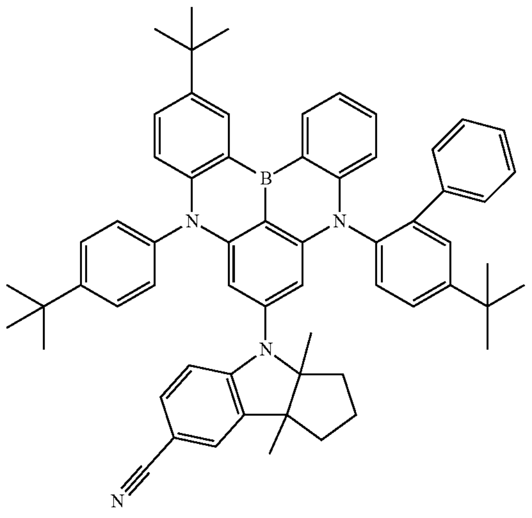
-continued
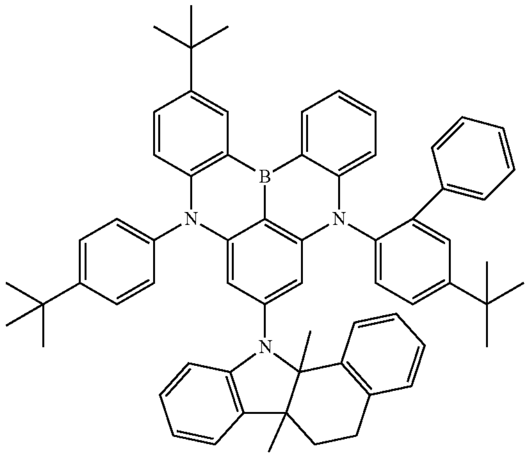
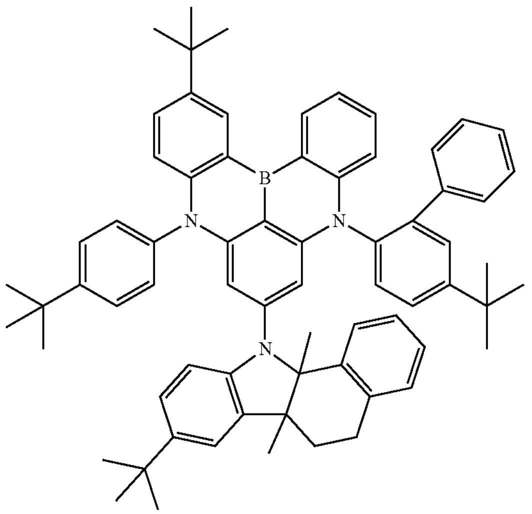
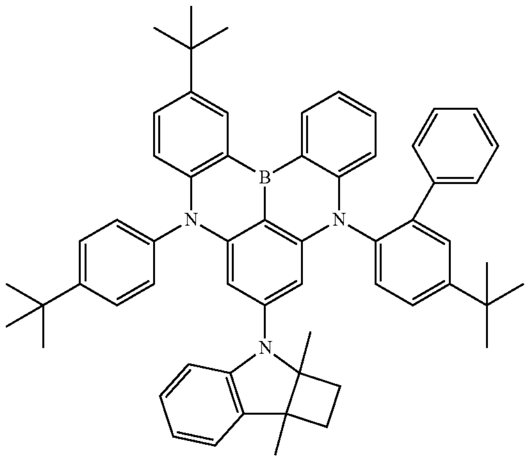

-continued
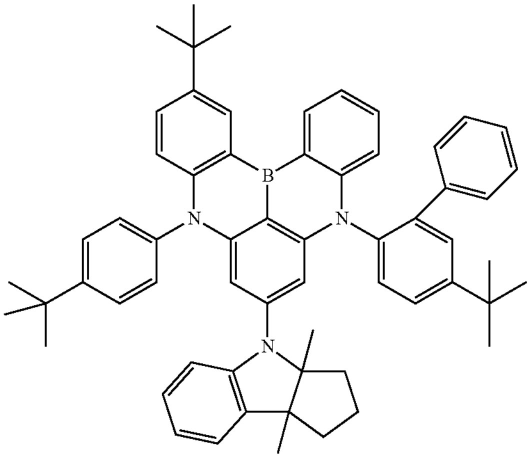
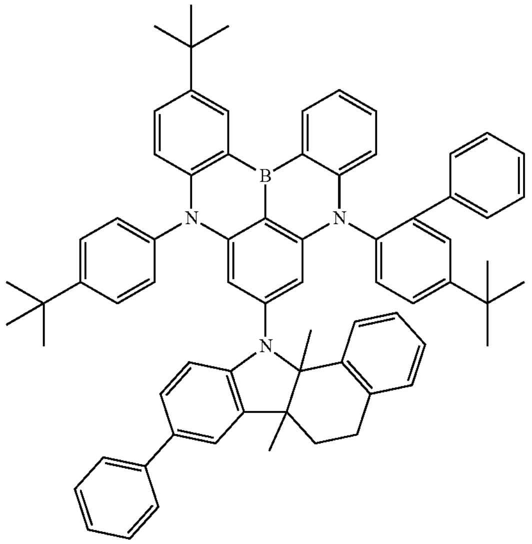
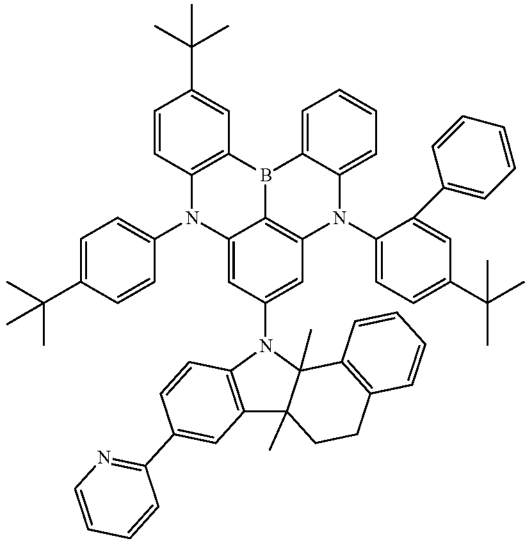
-continued
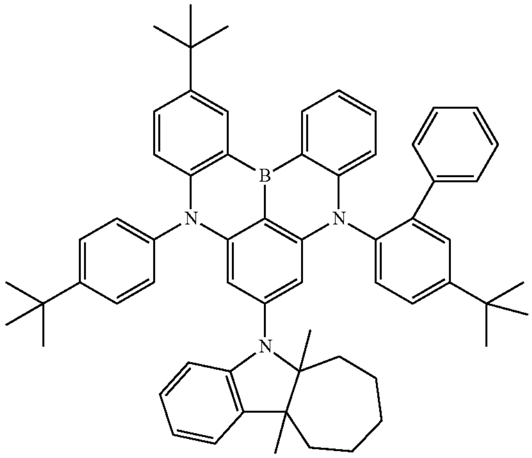
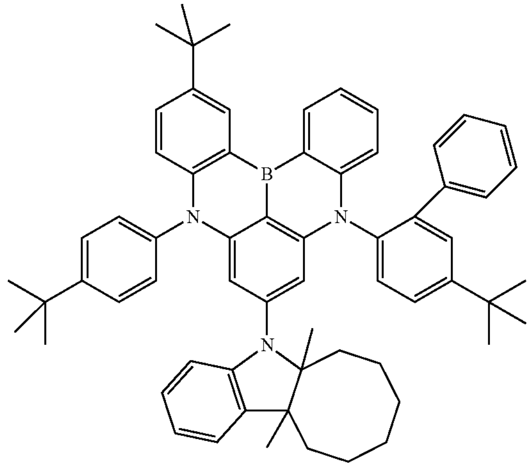
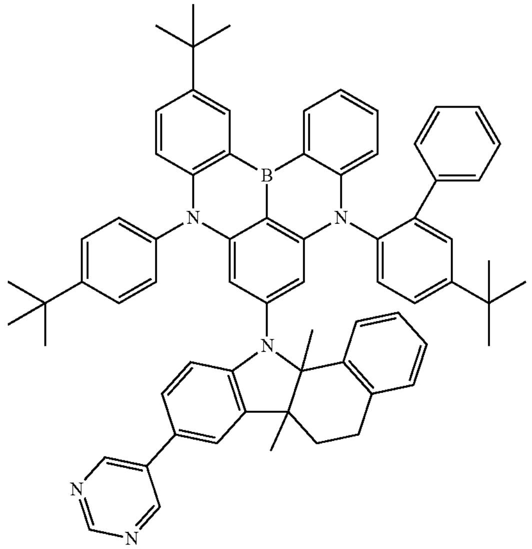

-continued
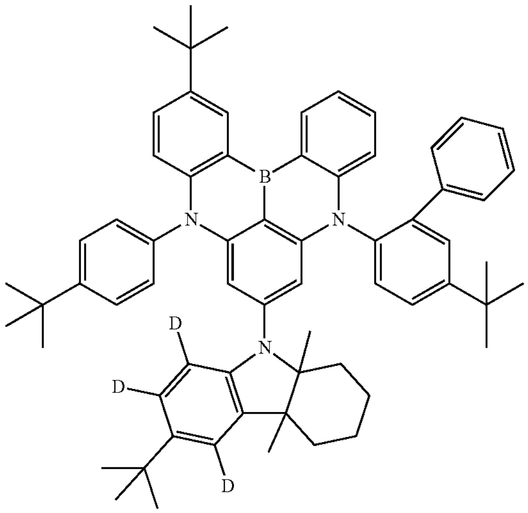
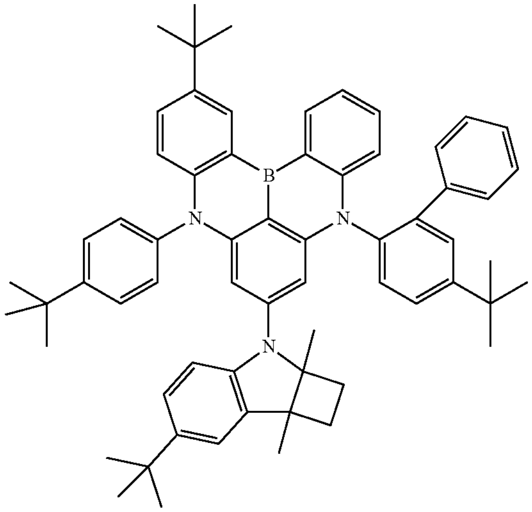
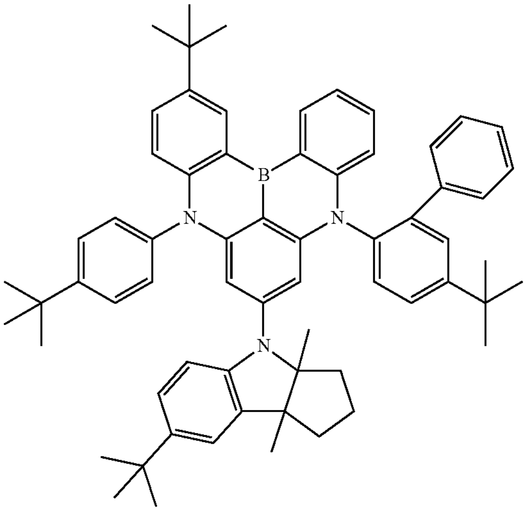
-continued
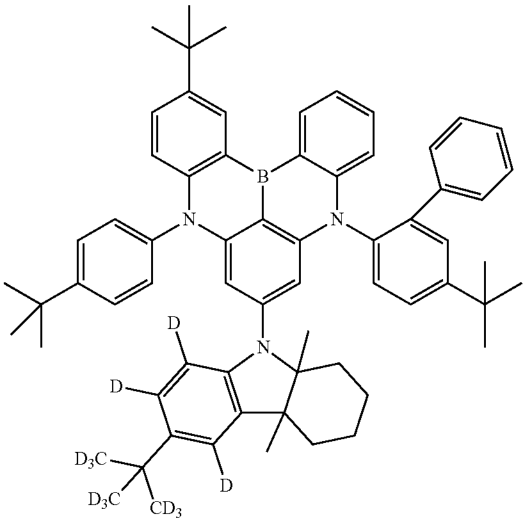
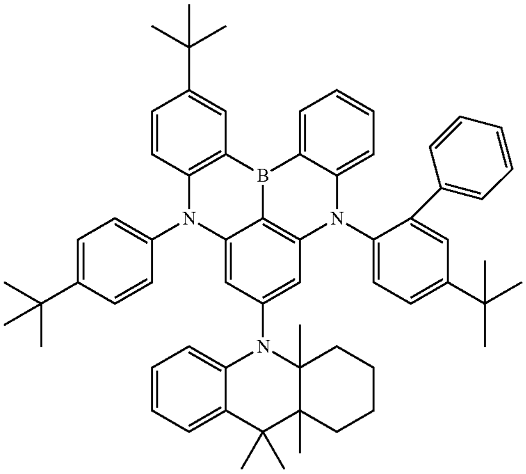
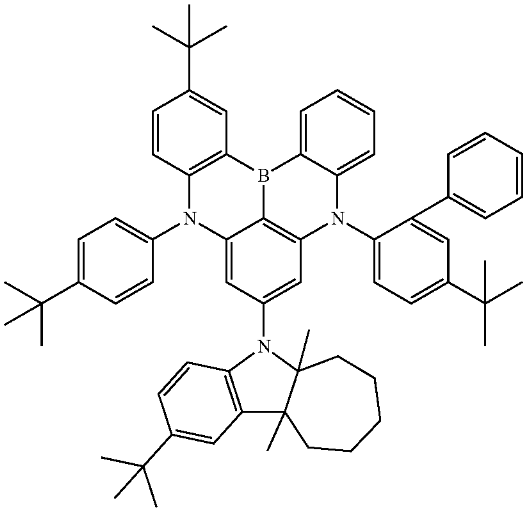

-continued
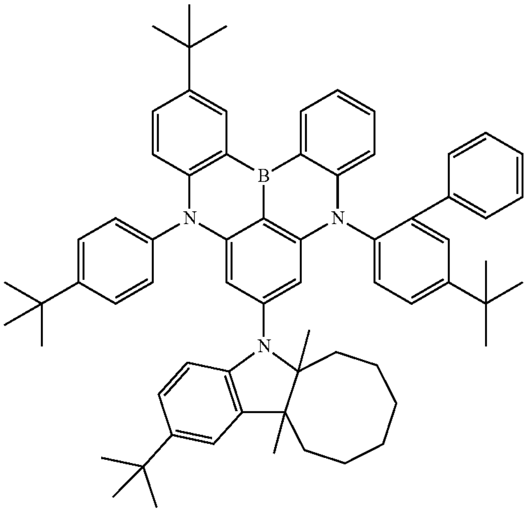
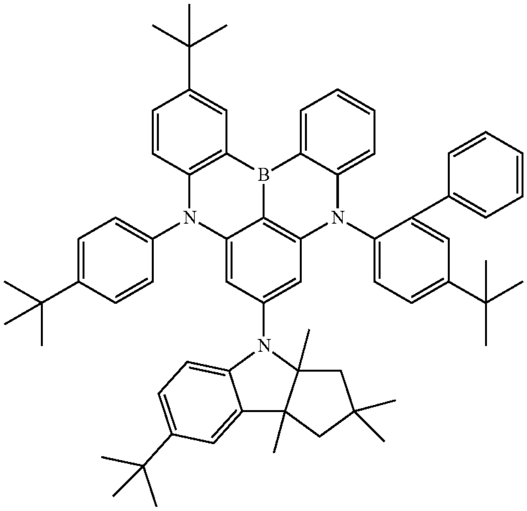
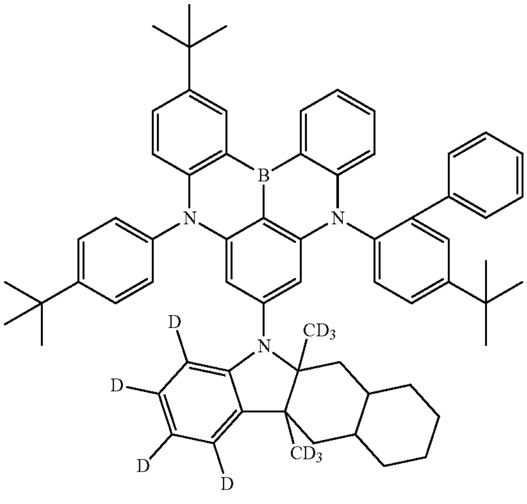
-continued
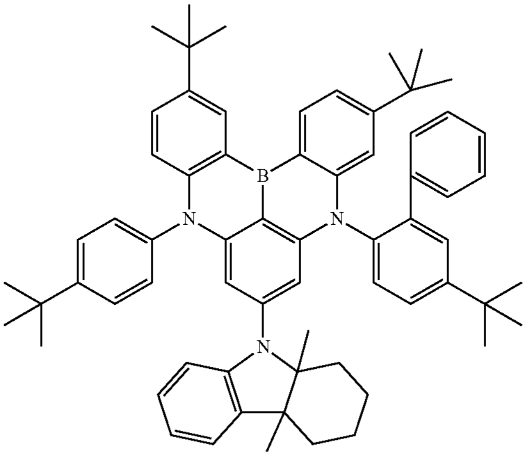
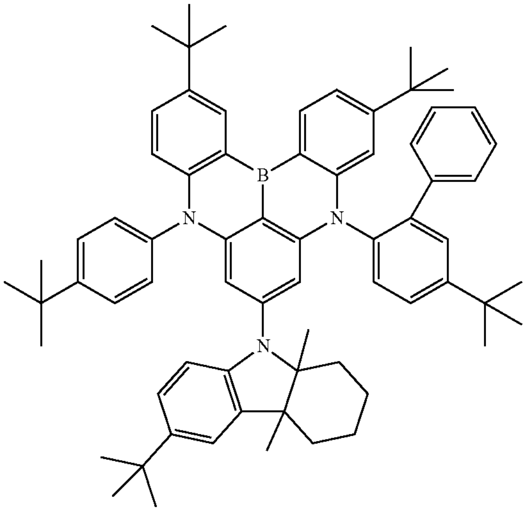
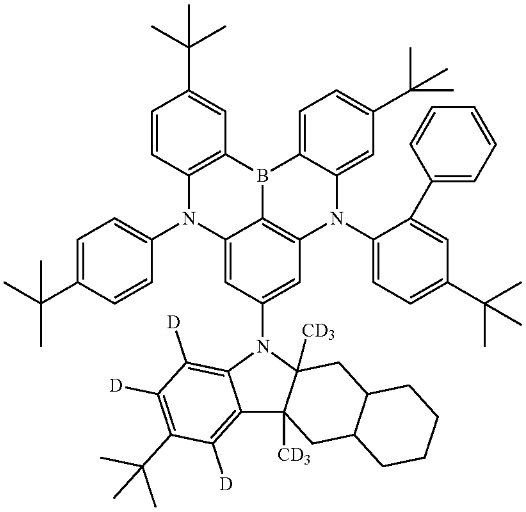

-continued
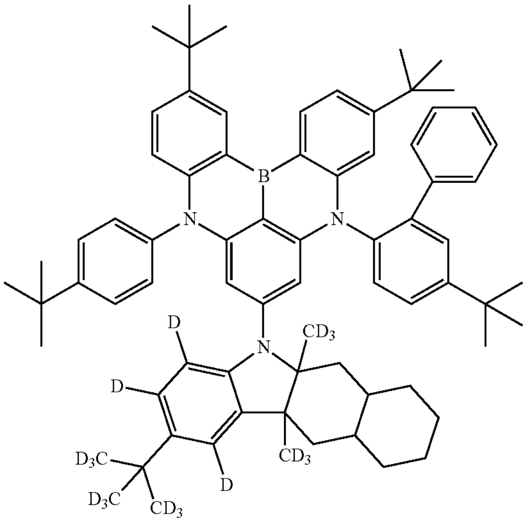
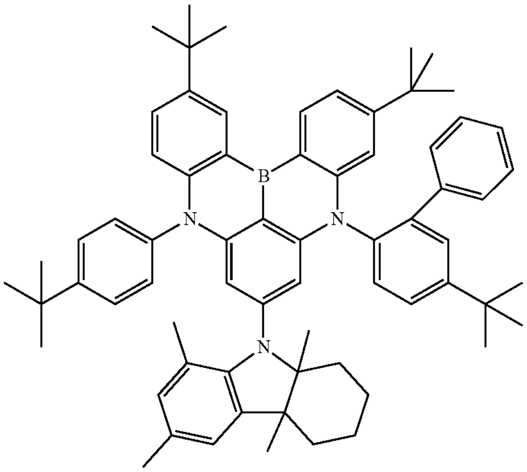
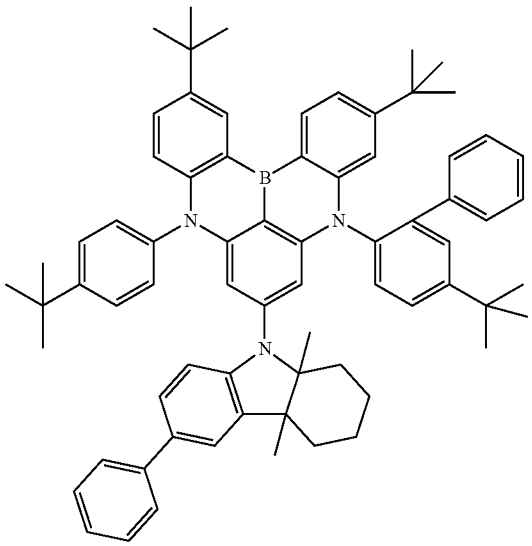
-continued
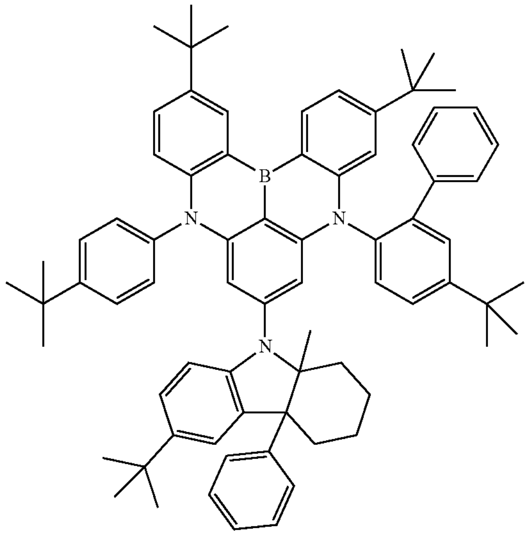
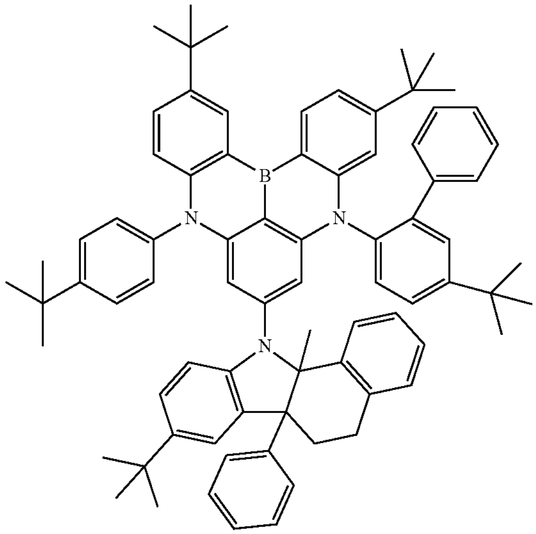
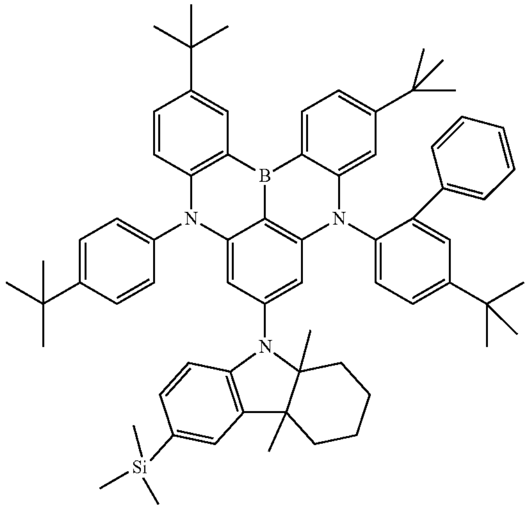

-continued
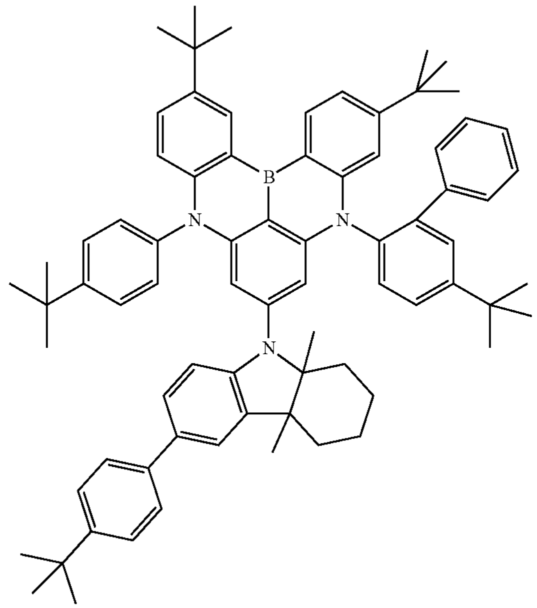
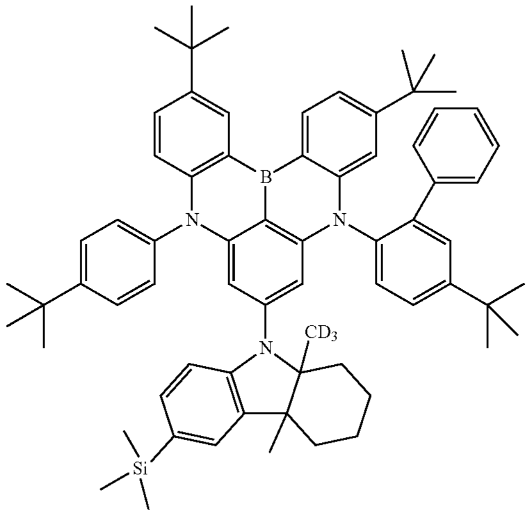
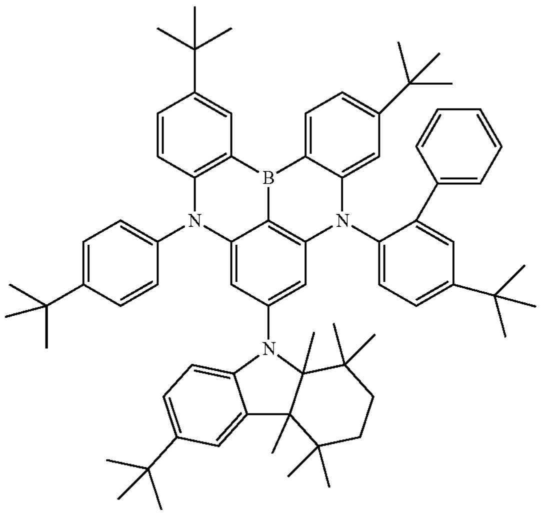
-continued
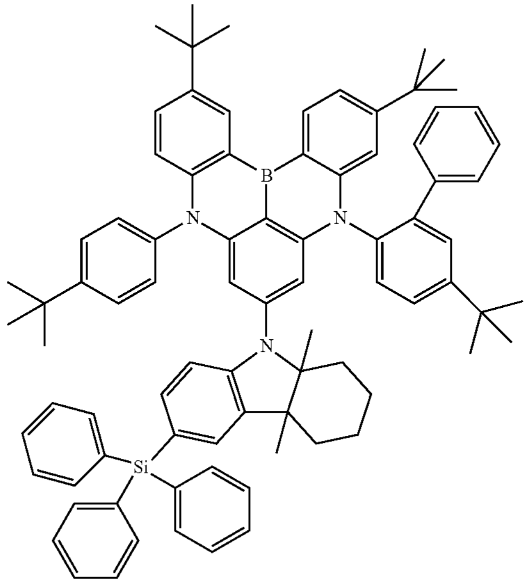
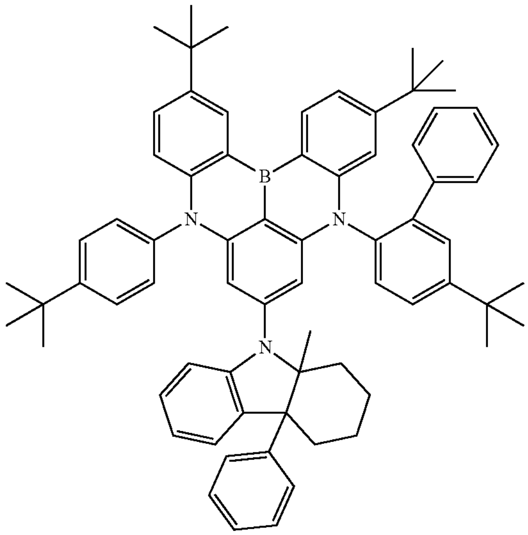
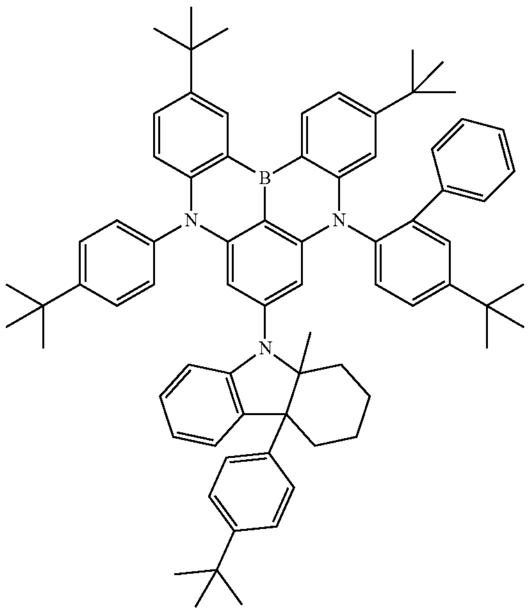

-continued
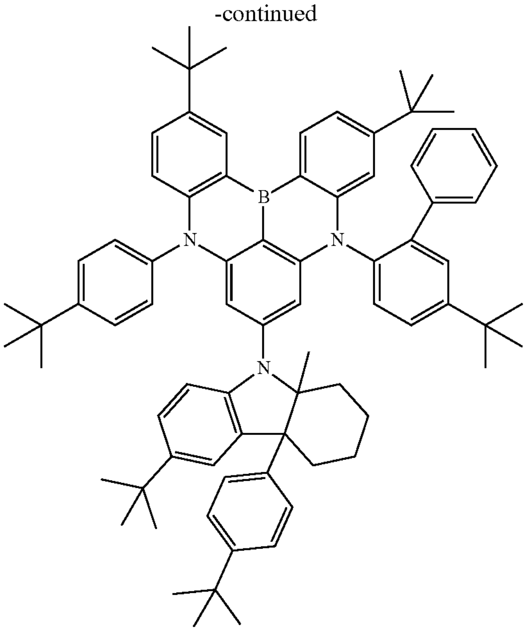
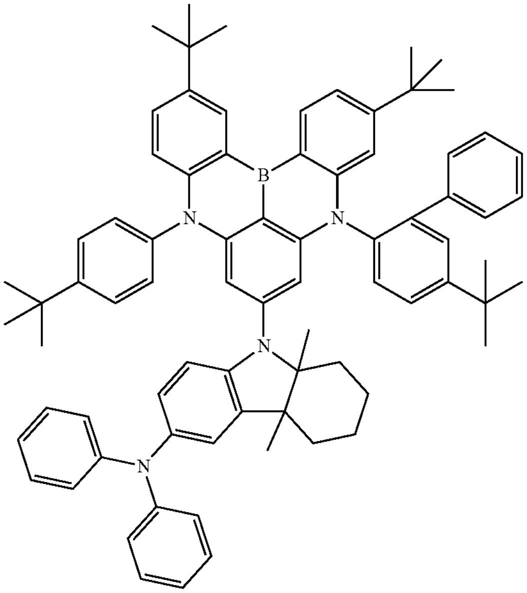
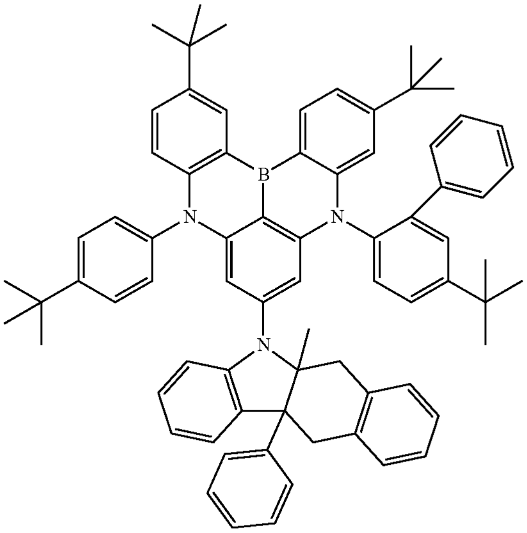
-continued
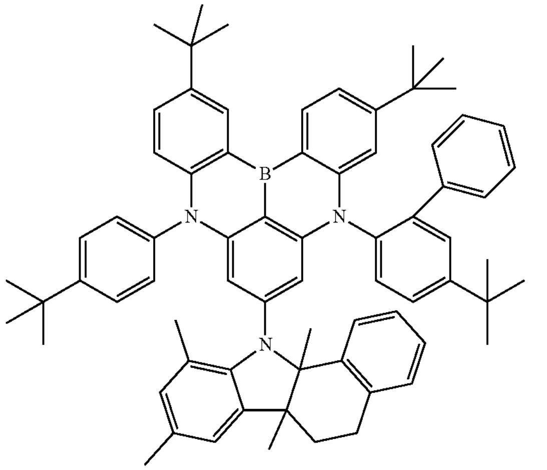
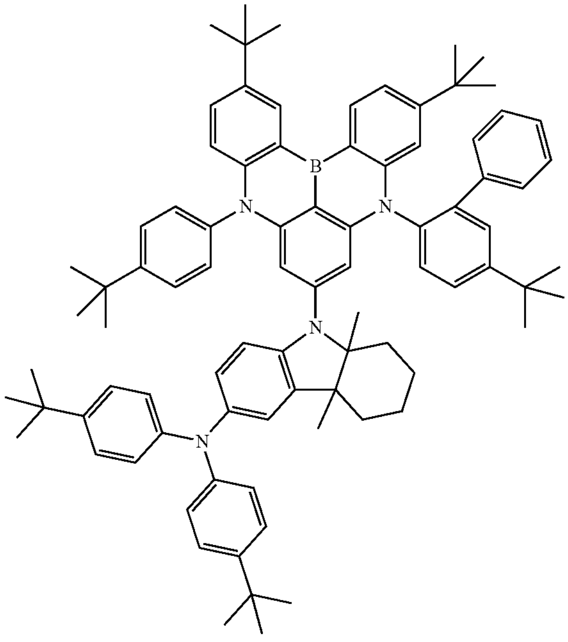
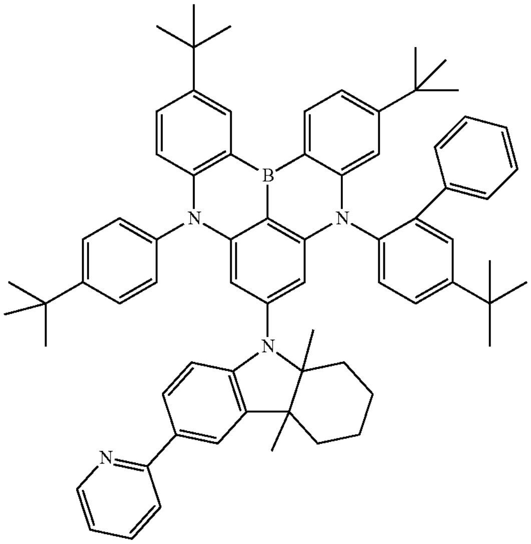

-continued
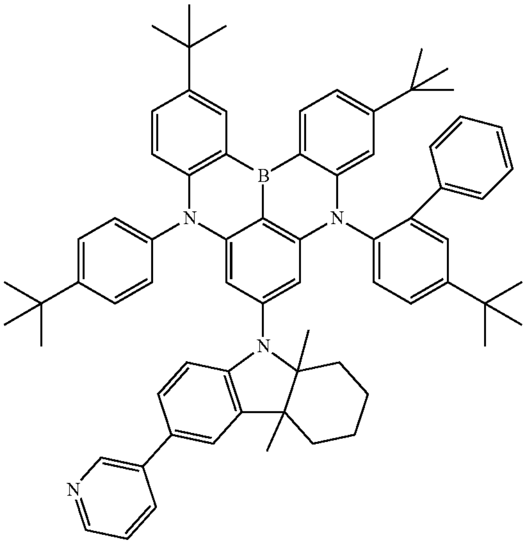
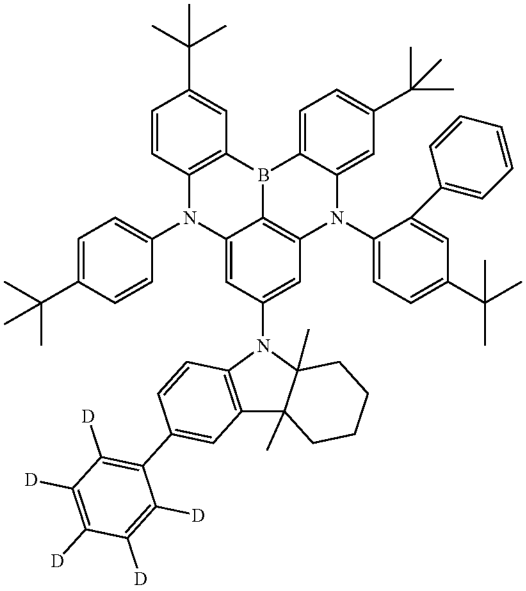
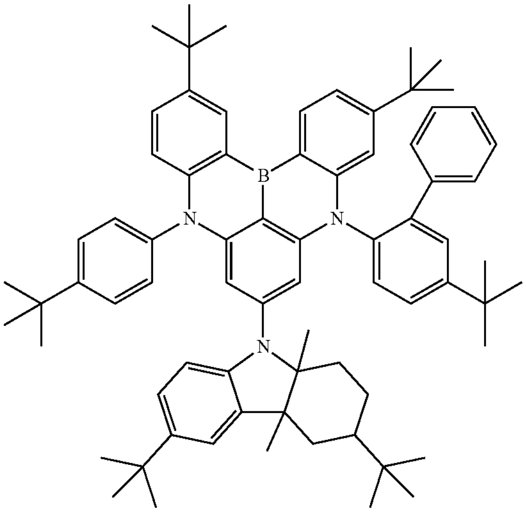
-continued
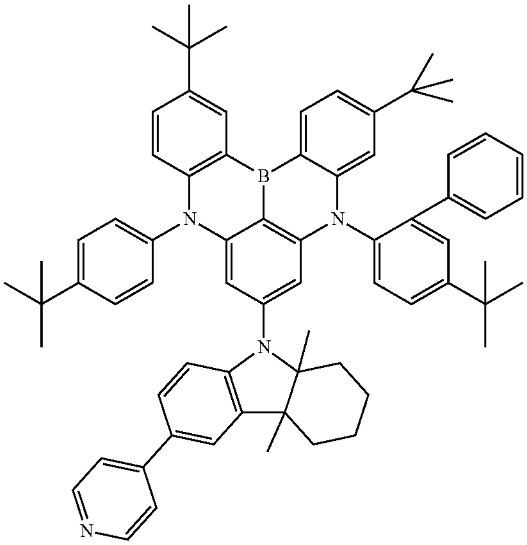
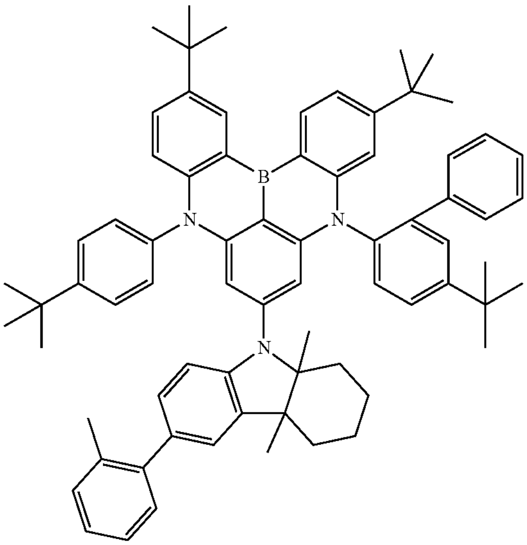
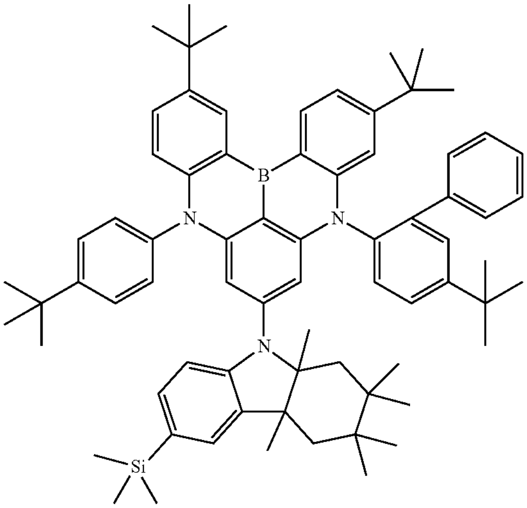

-continued
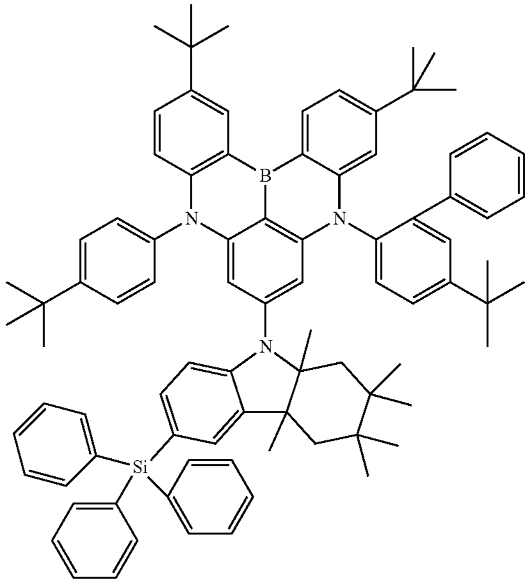
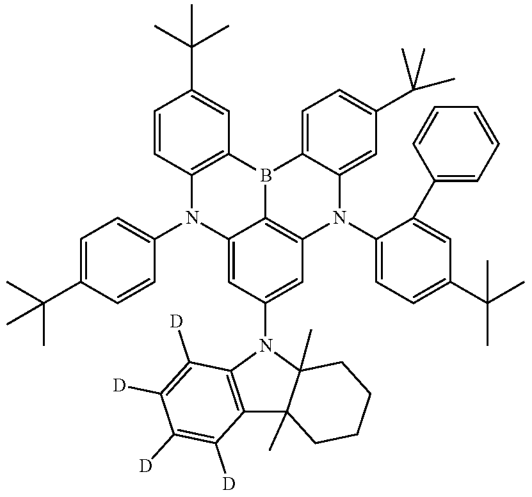
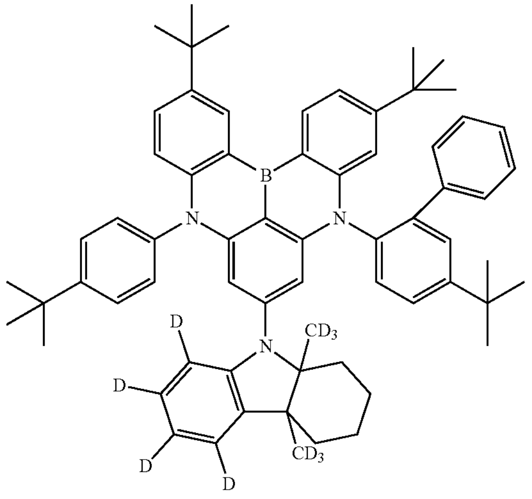
-continued
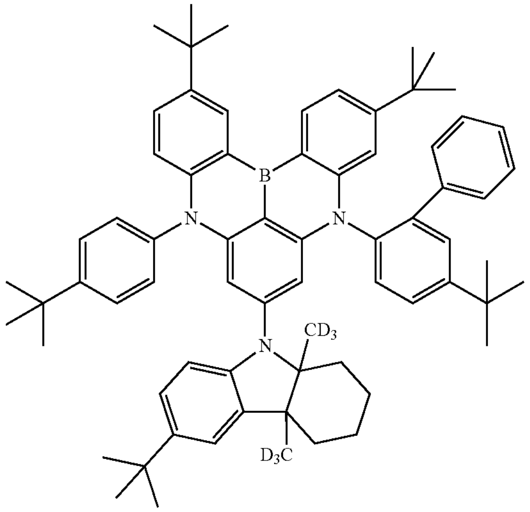
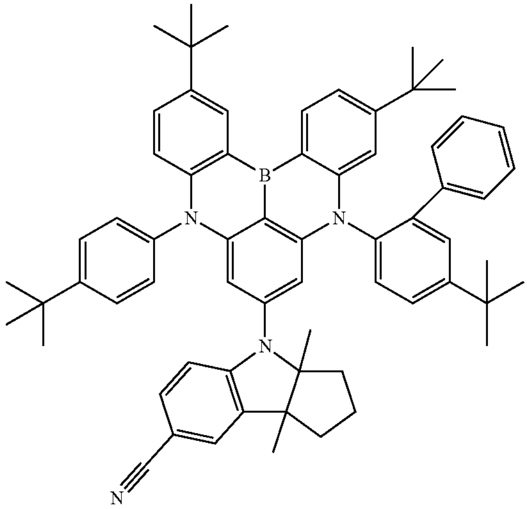
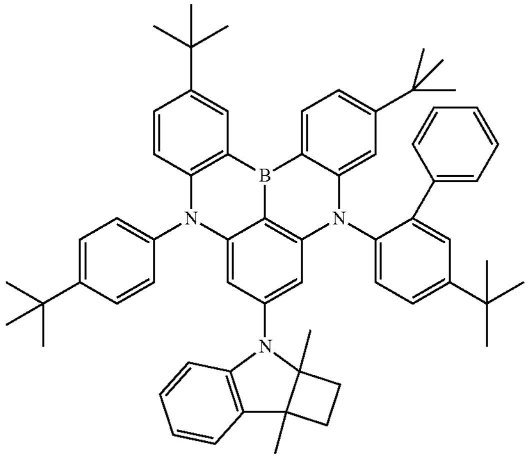

-continued
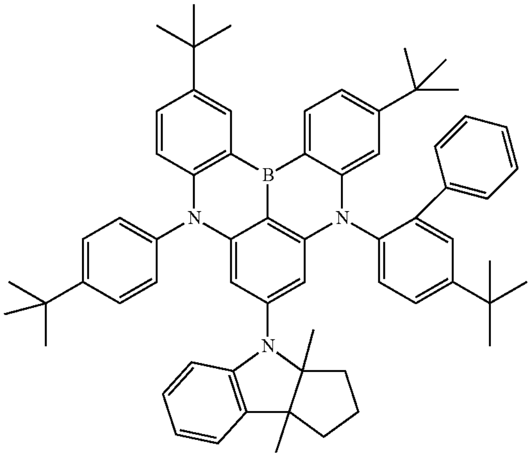
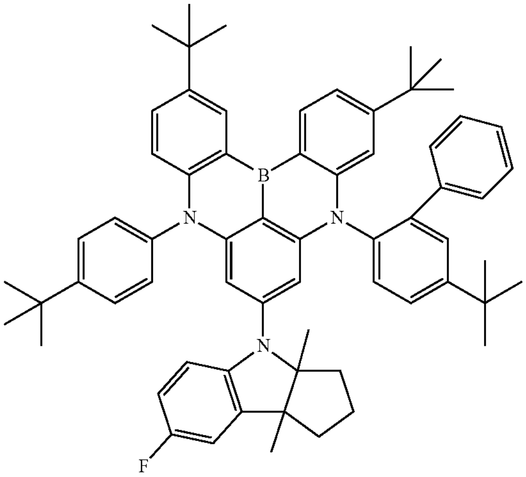
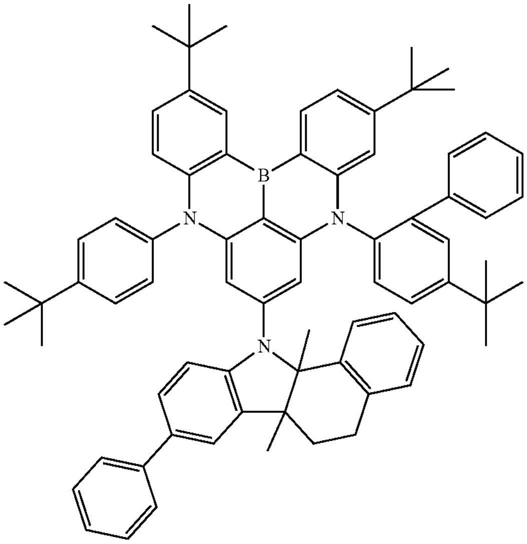
-continued
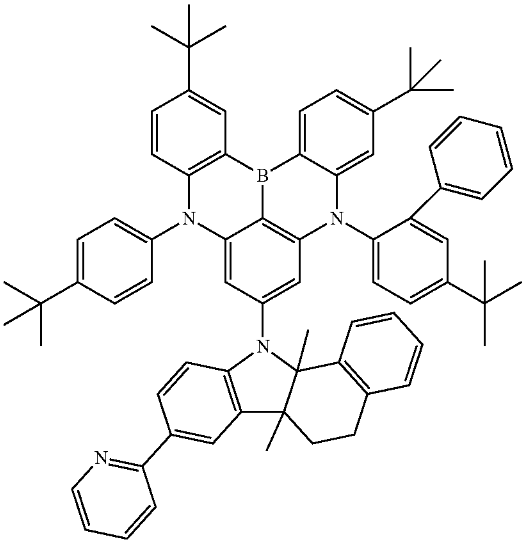
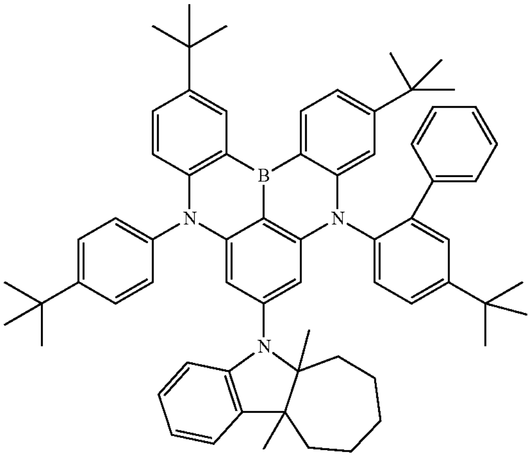
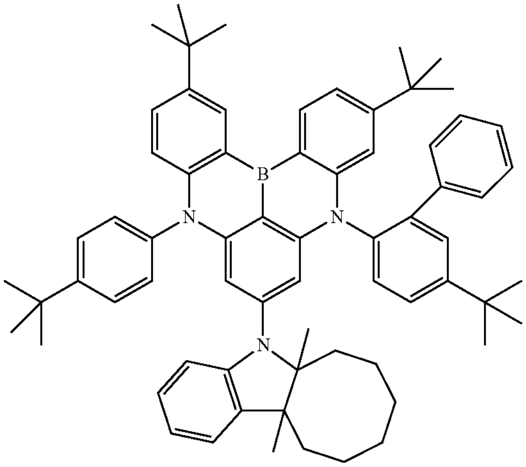

-continued
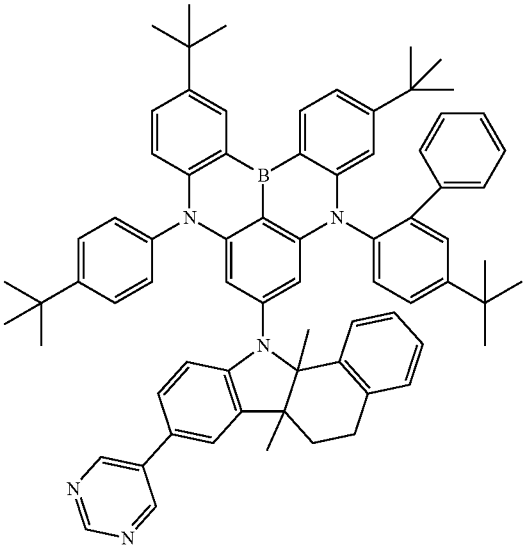
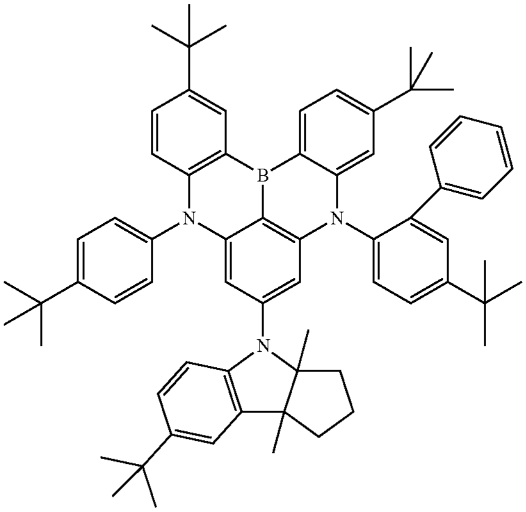
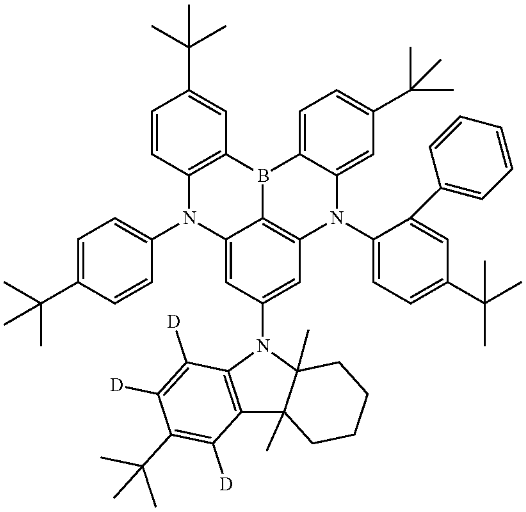
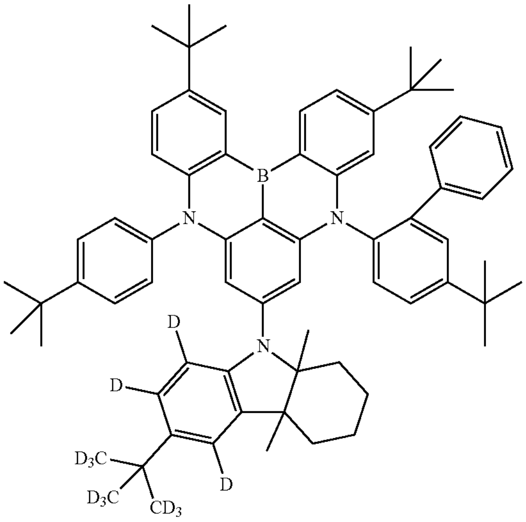
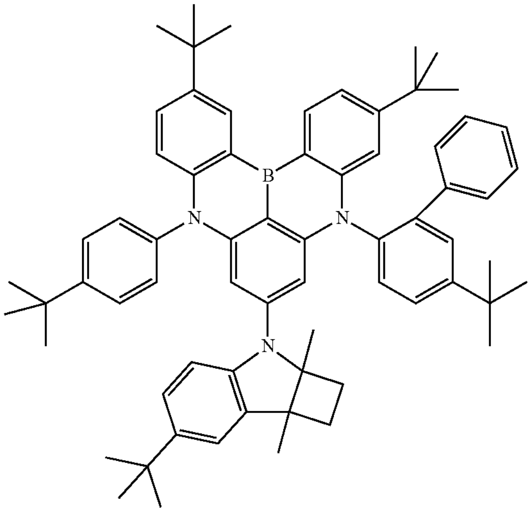
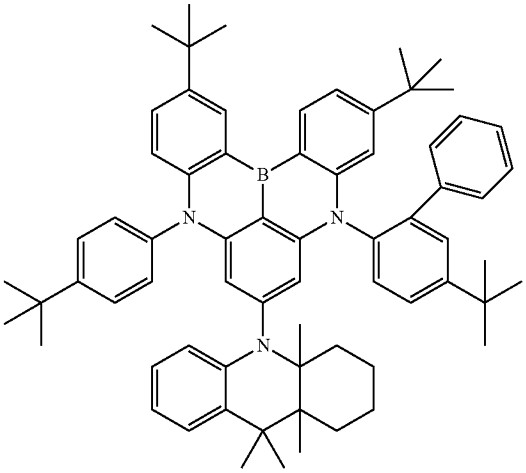

-continued
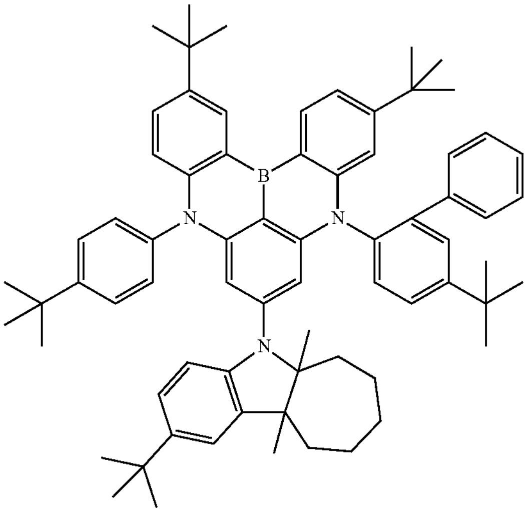
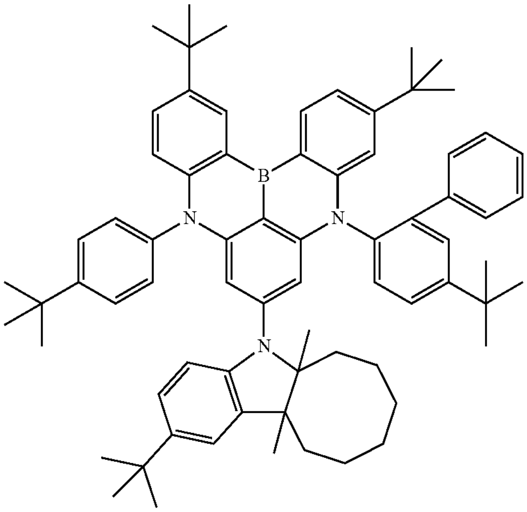
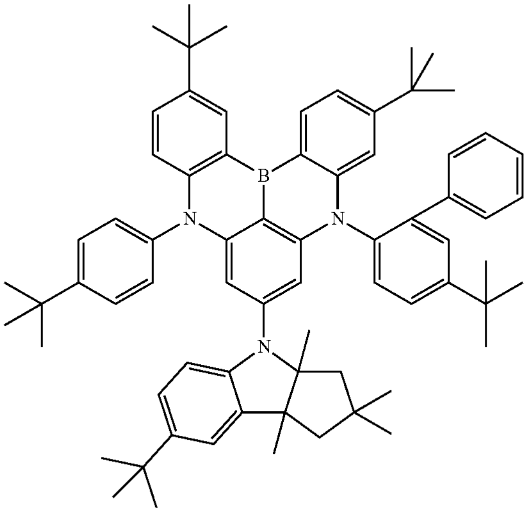
-continued
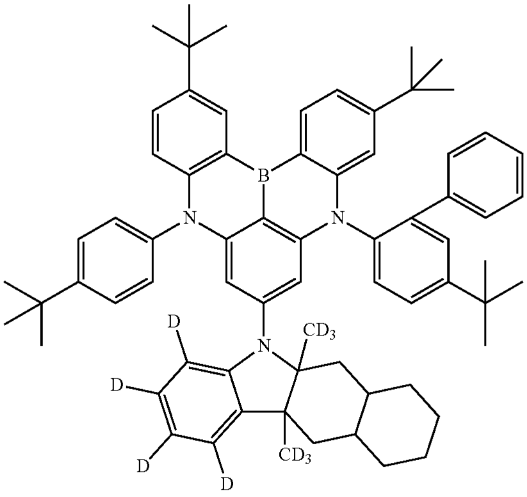
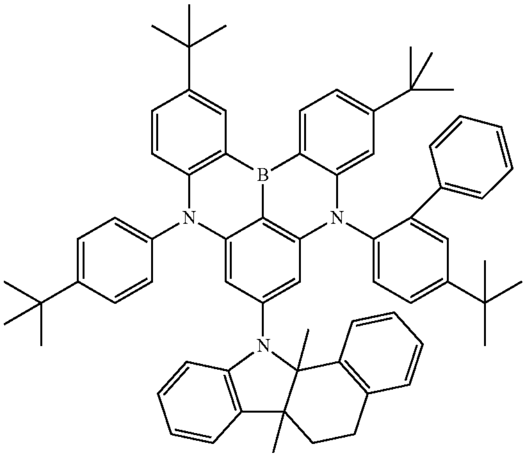
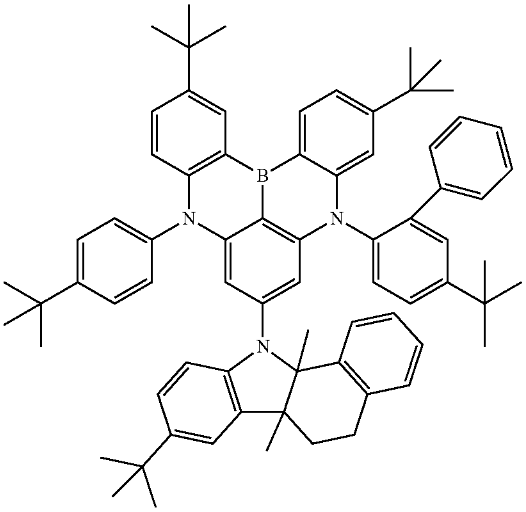

-continued
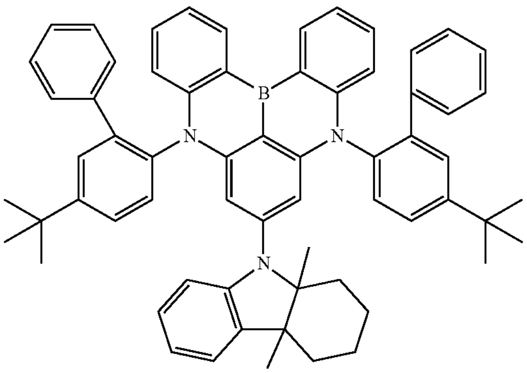
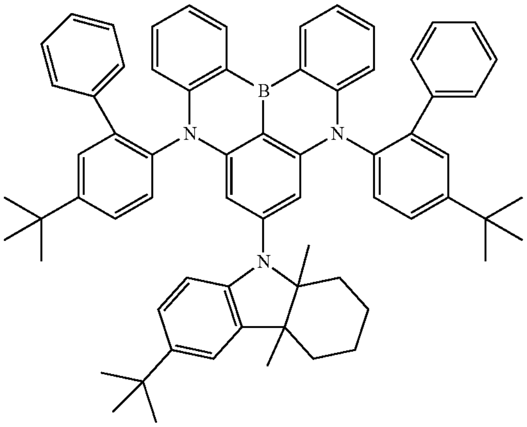
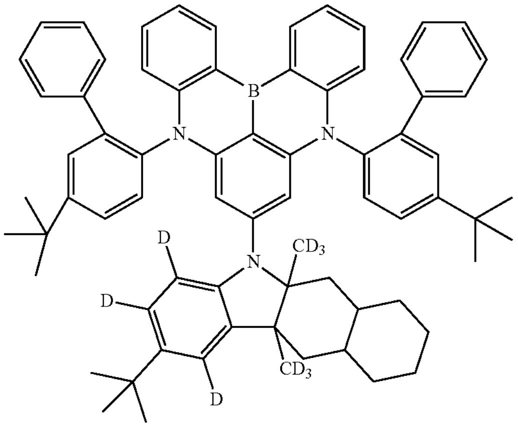
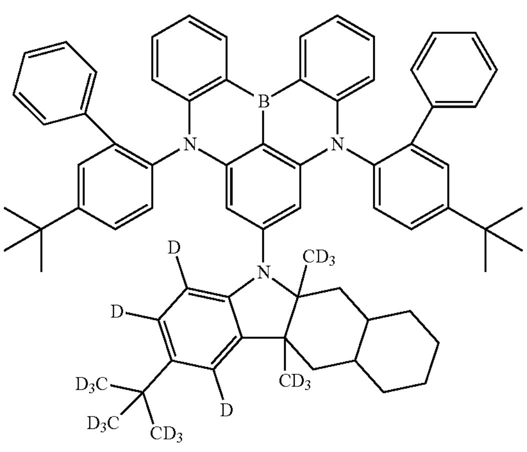
-continued
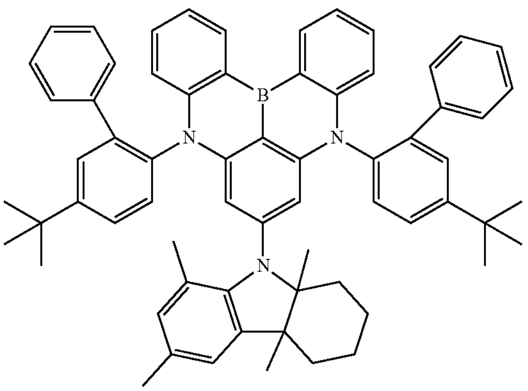
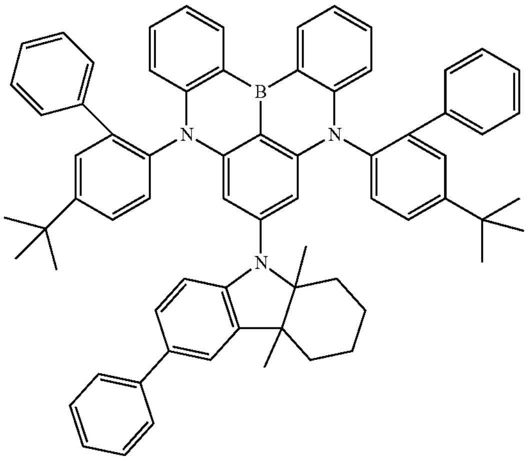
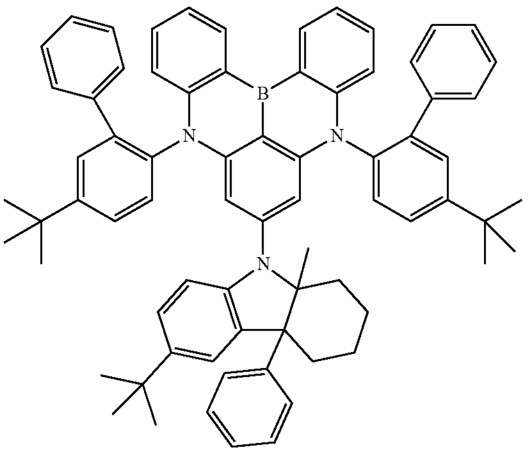

-continued
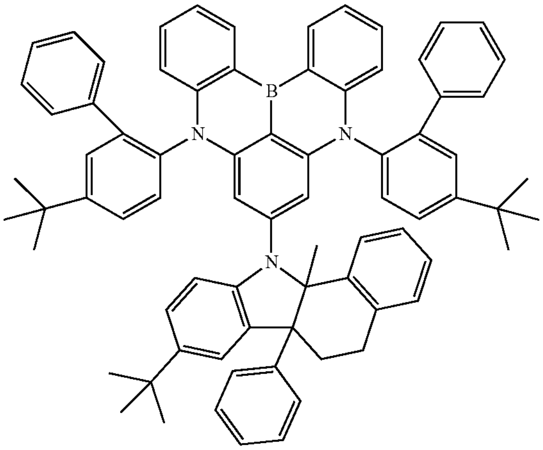
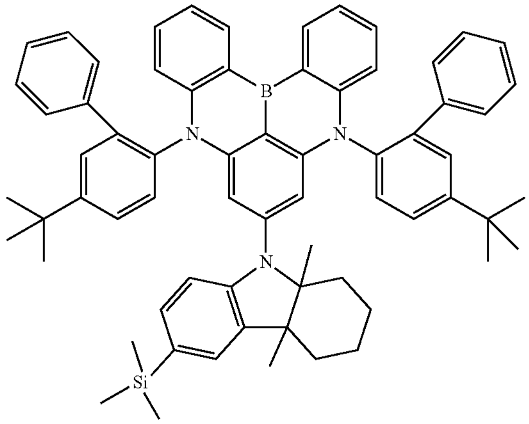
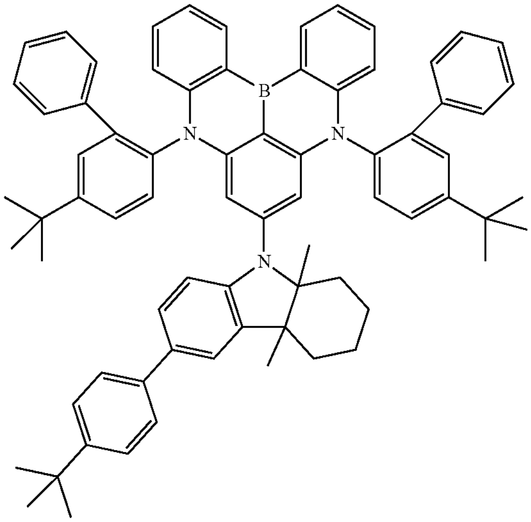
-continued
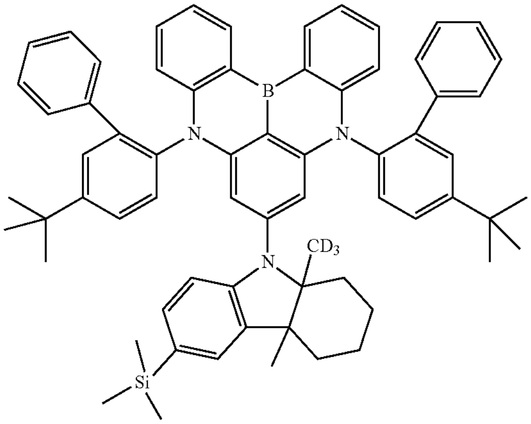
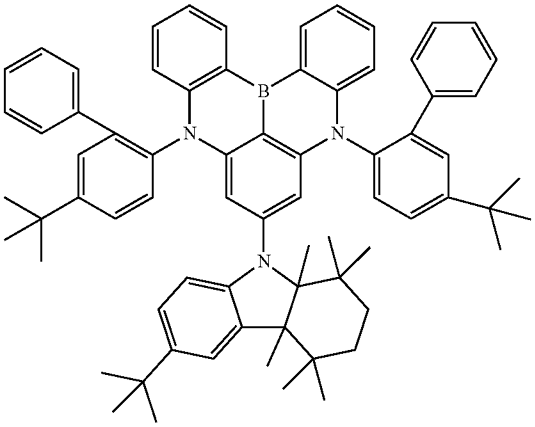
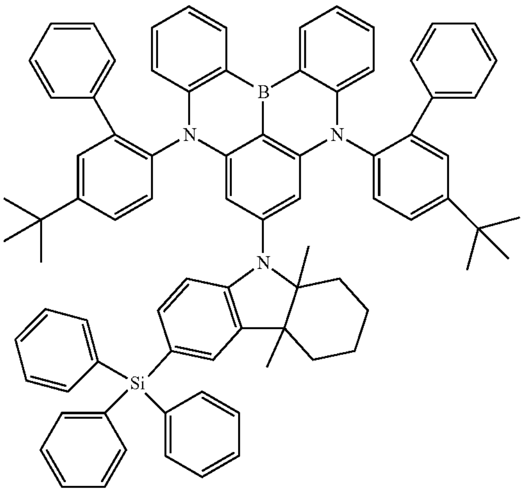

-continued
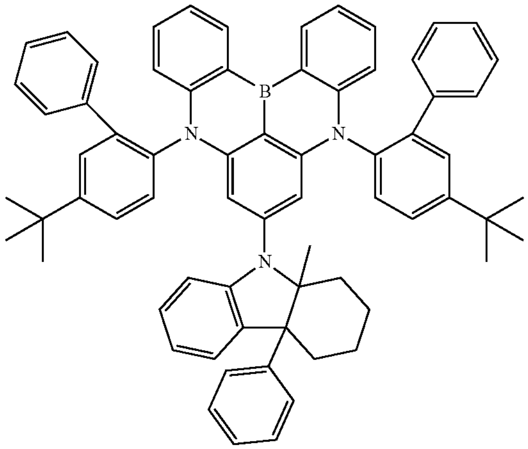
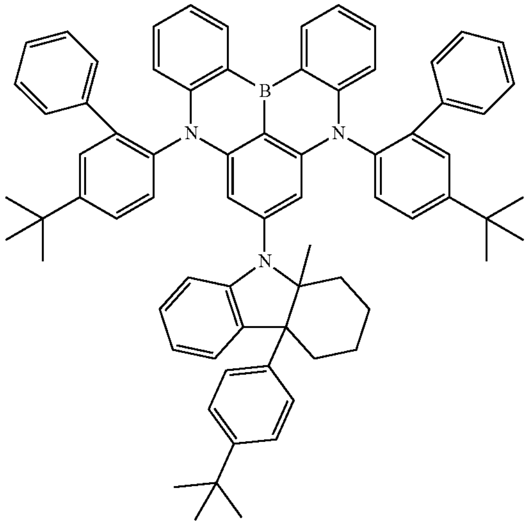
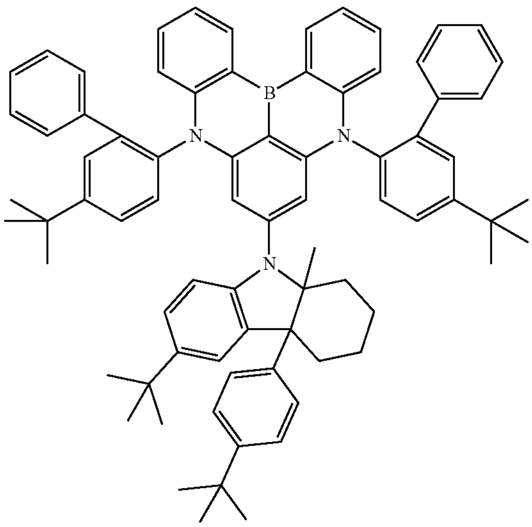
-continued
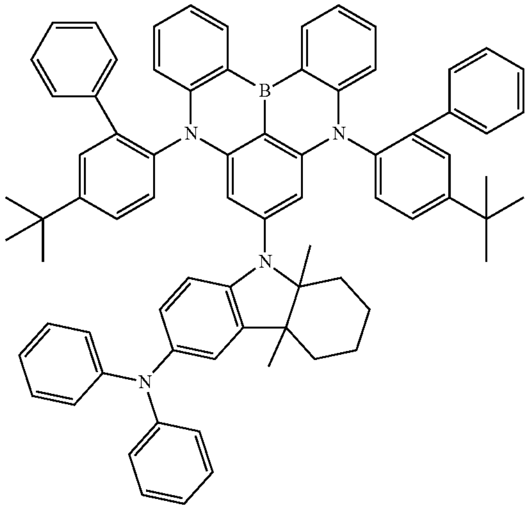
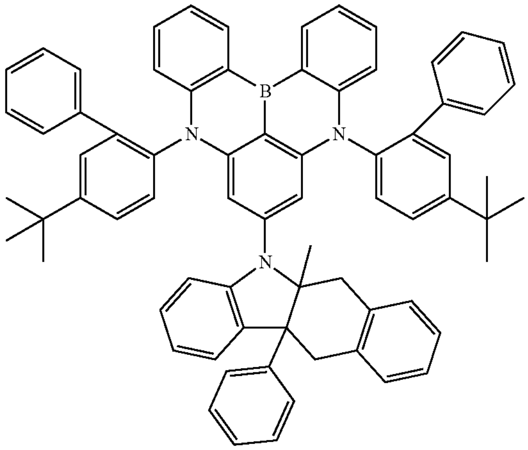
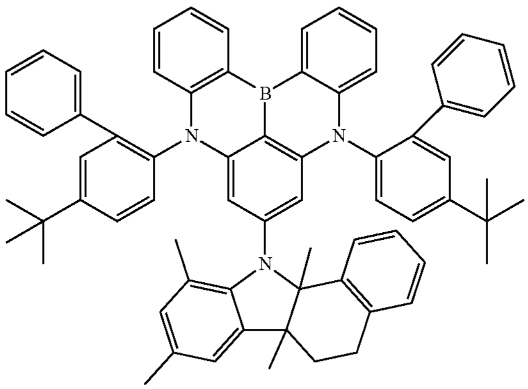

-continued
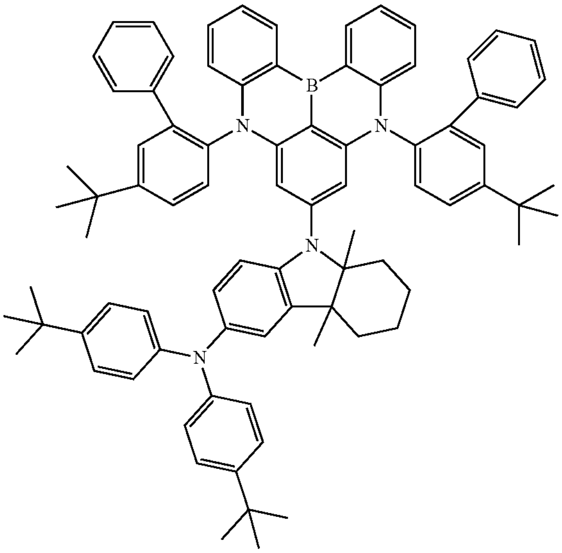
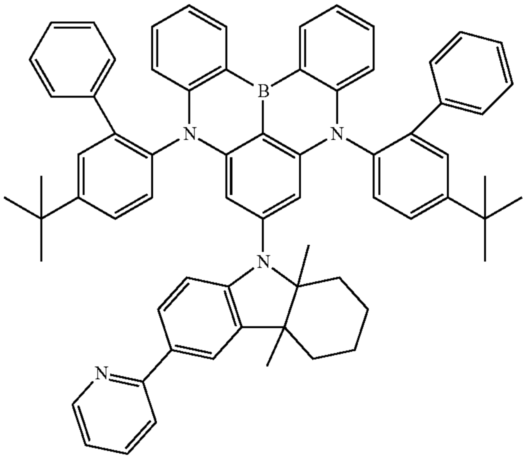
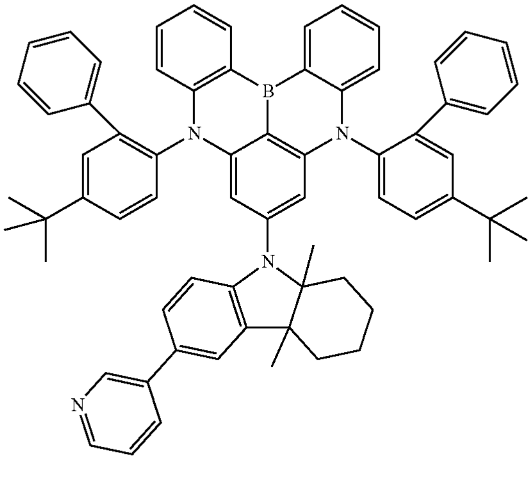
-continued
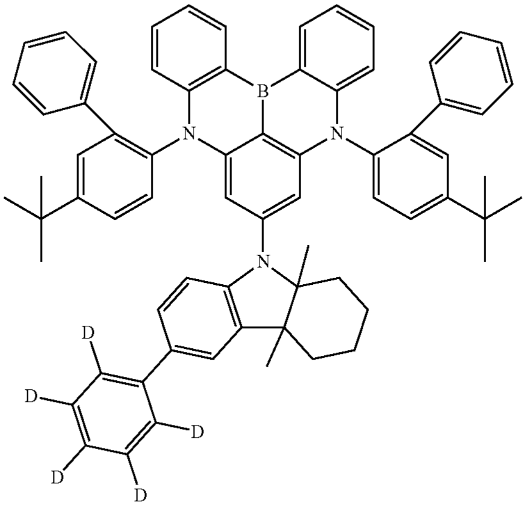
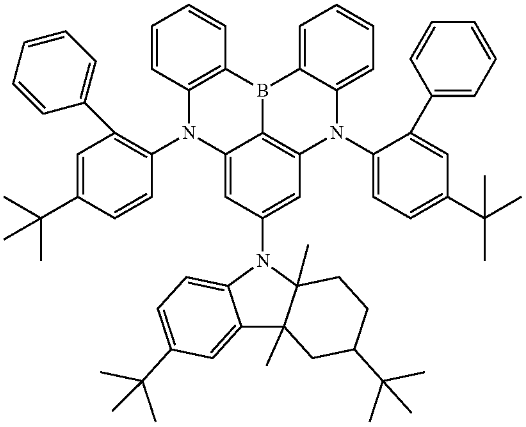
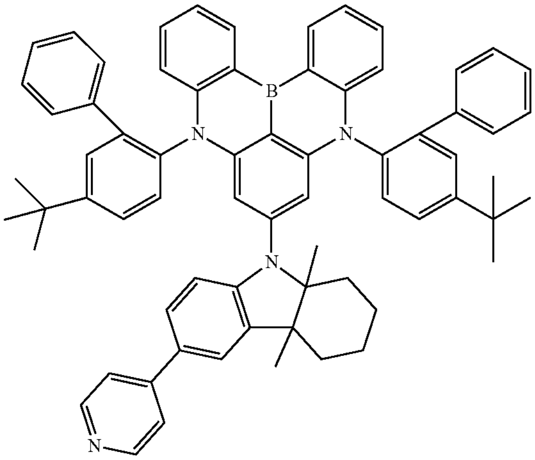

-continued
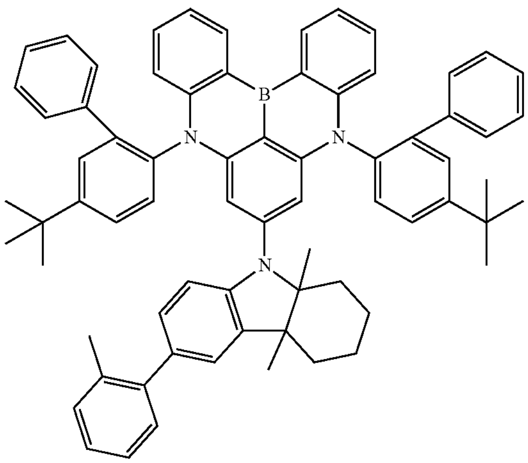
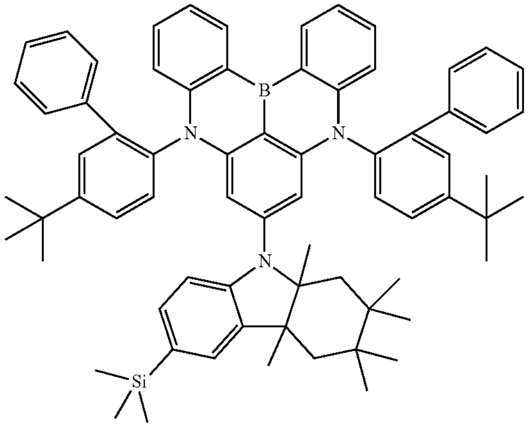
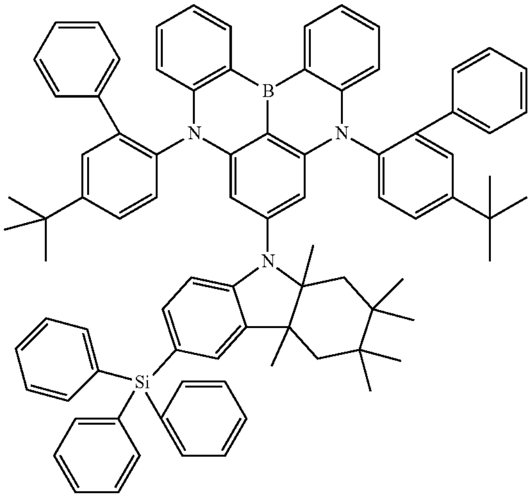
-continued
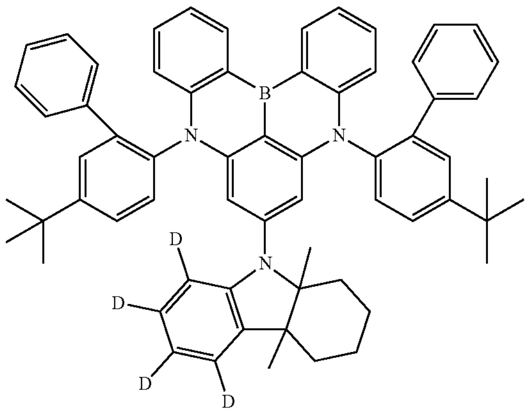
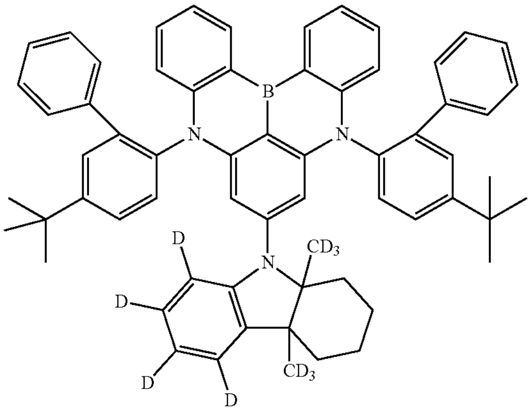
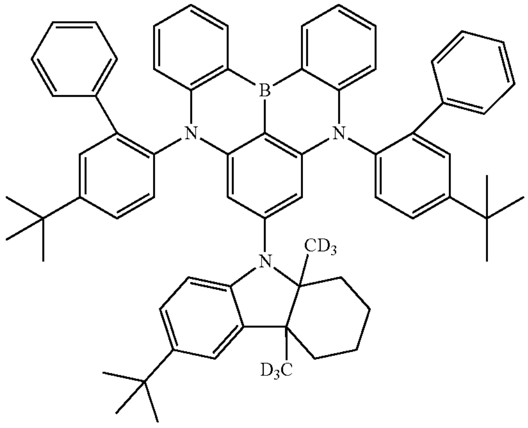
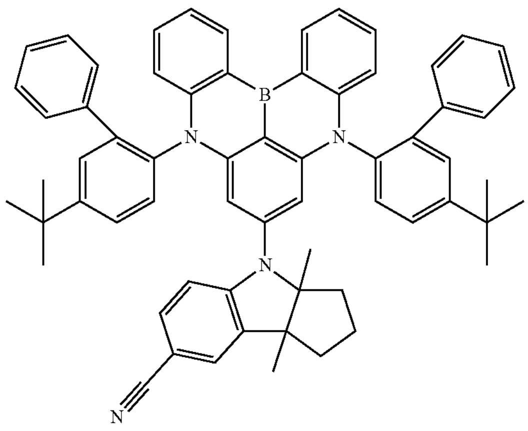

-continued
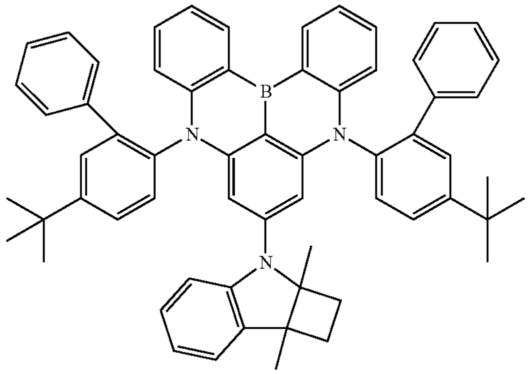
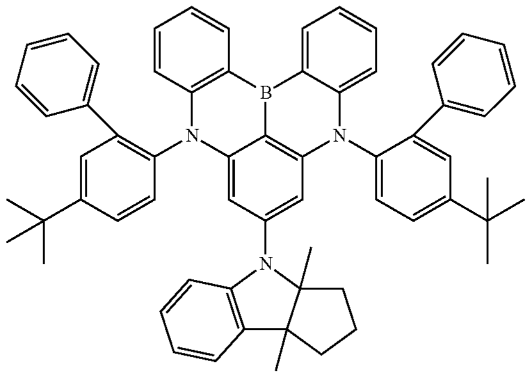
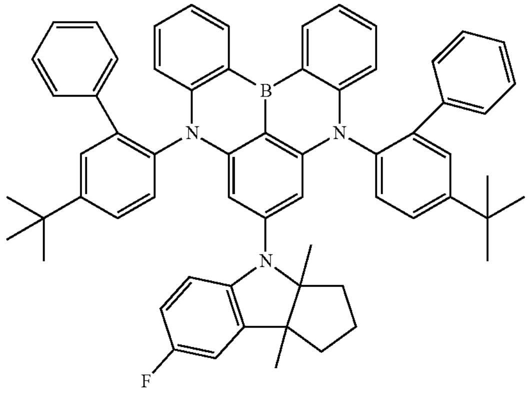
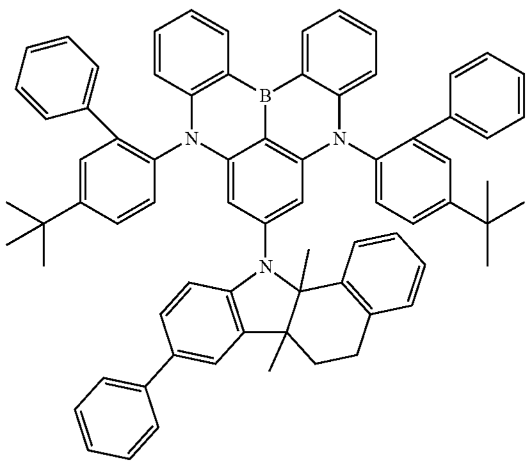
-continued
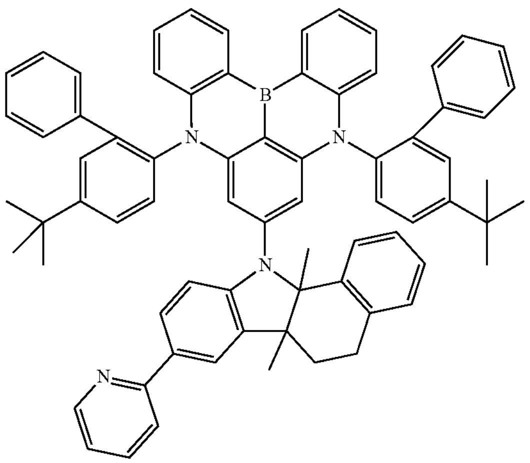
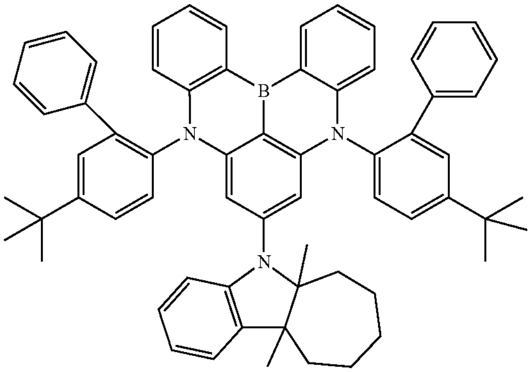
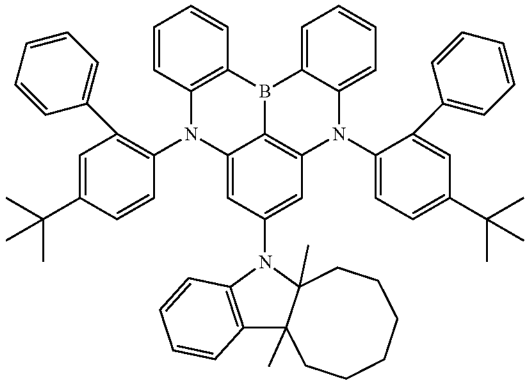
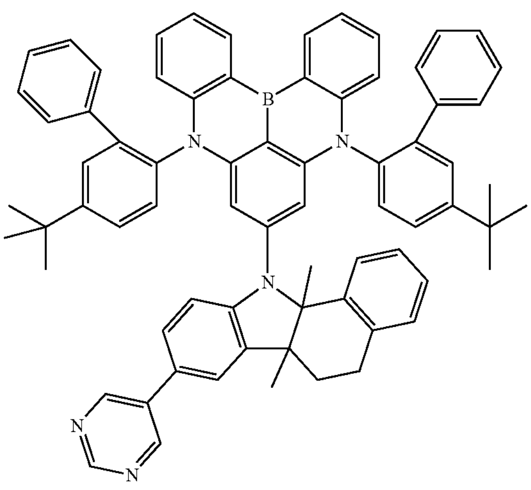

-continued
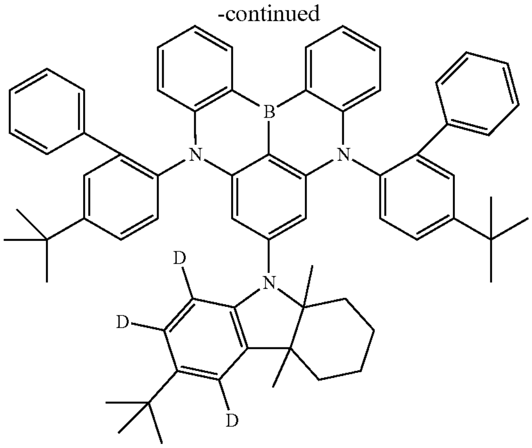
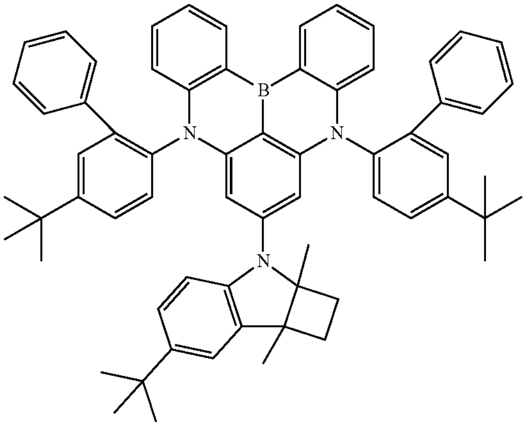
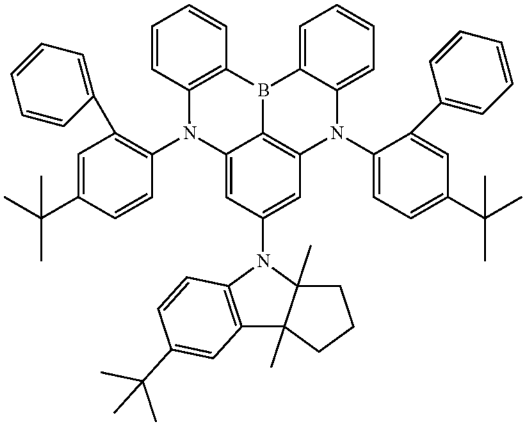
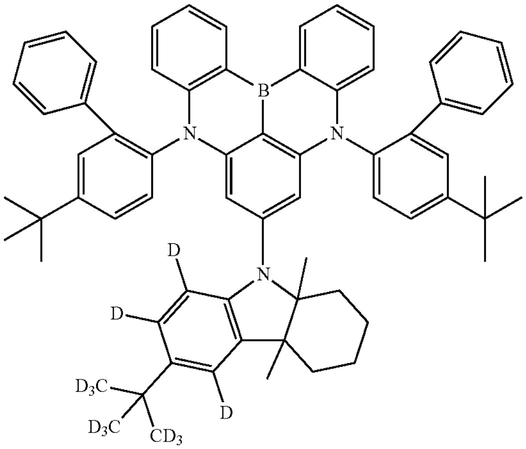
-continued
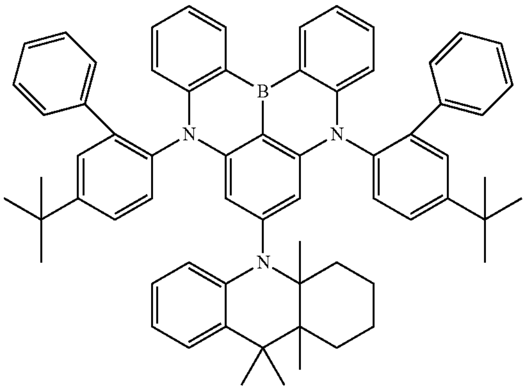
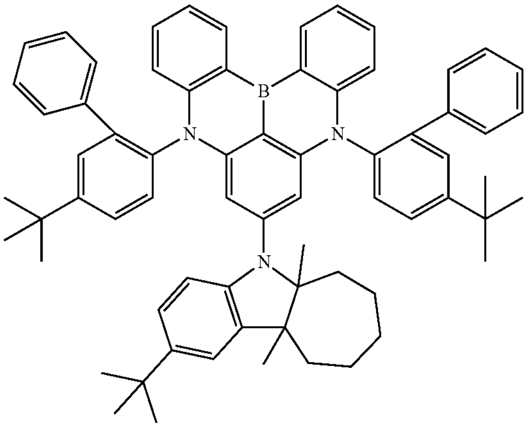
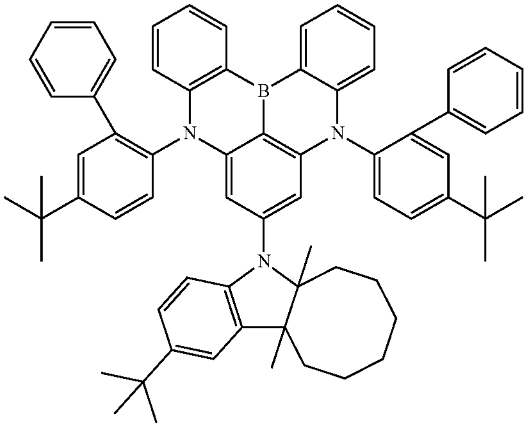
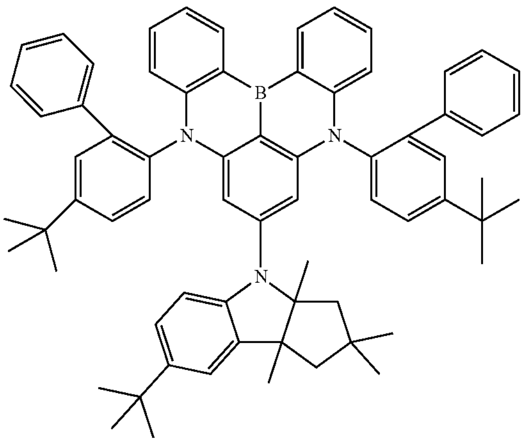

-continued
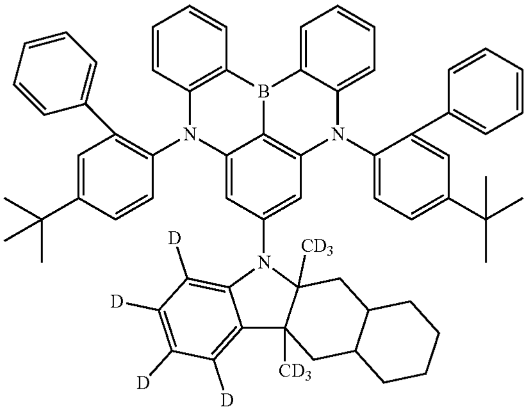
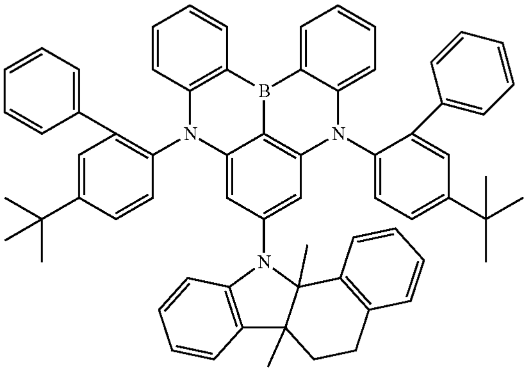
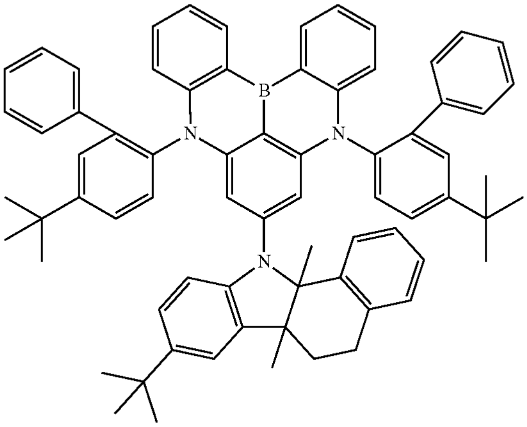
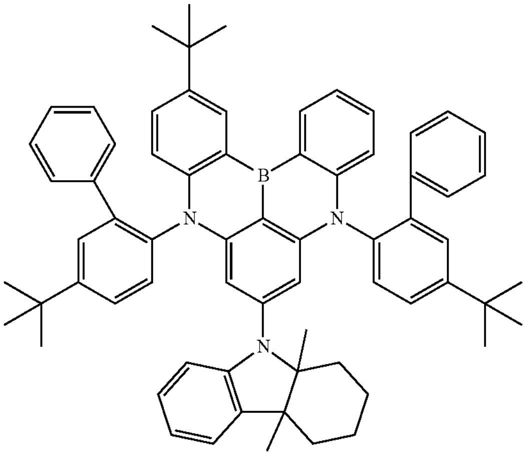
-continued
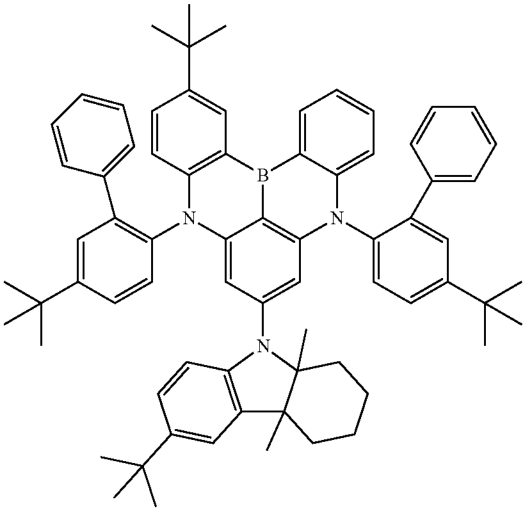
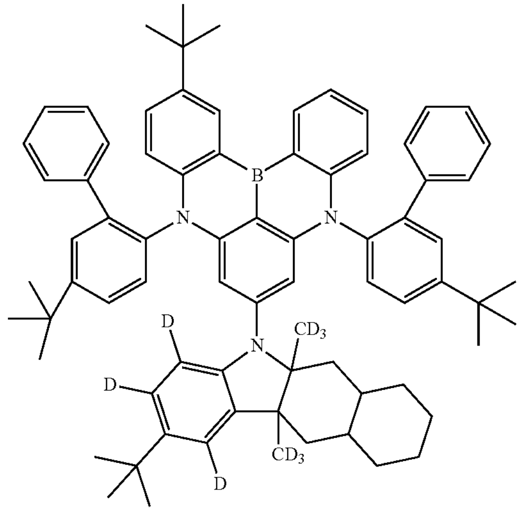
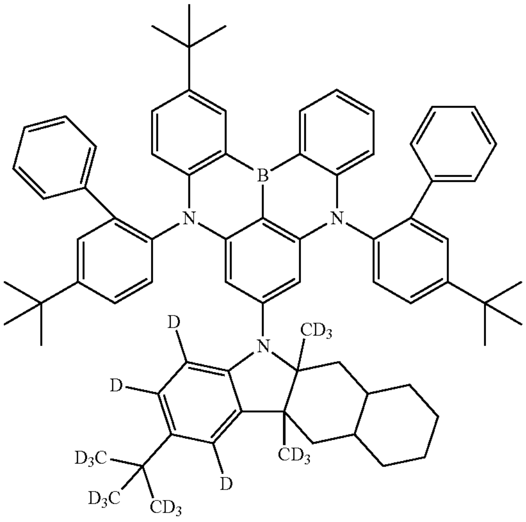

-continued
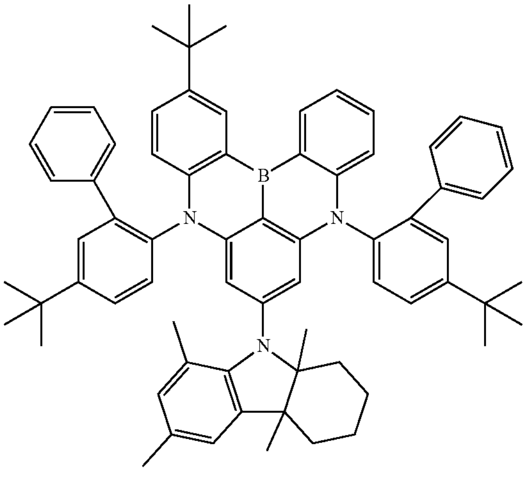
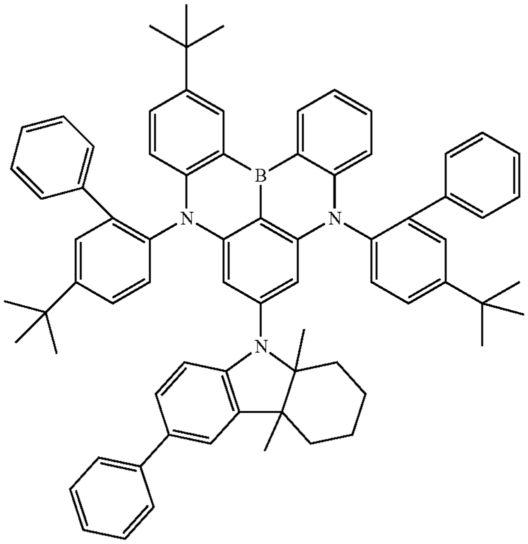
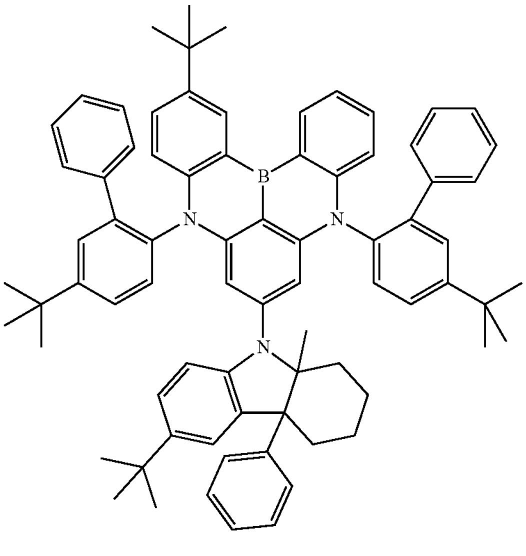
-continued
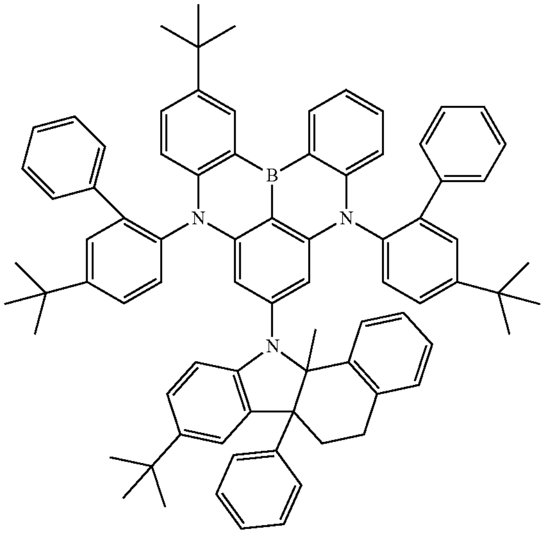
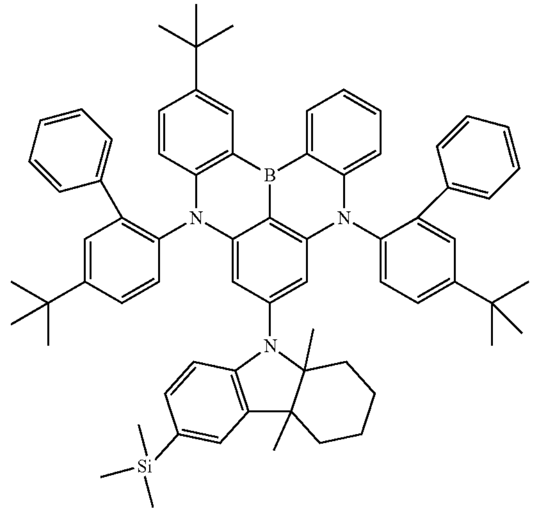
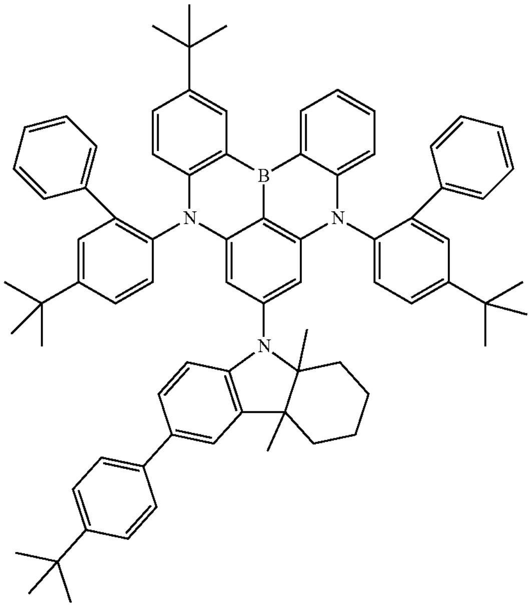

-continued
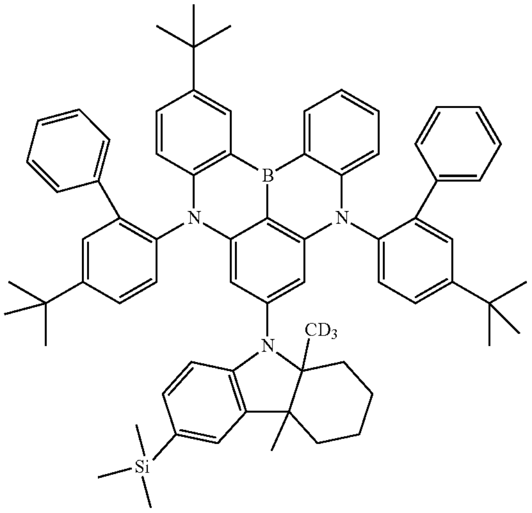
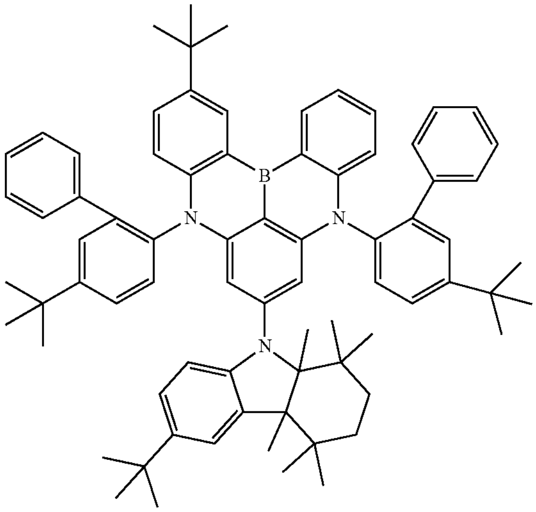
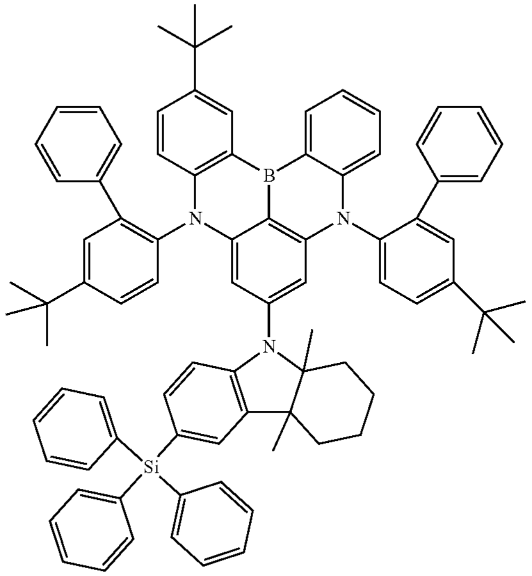
-continued
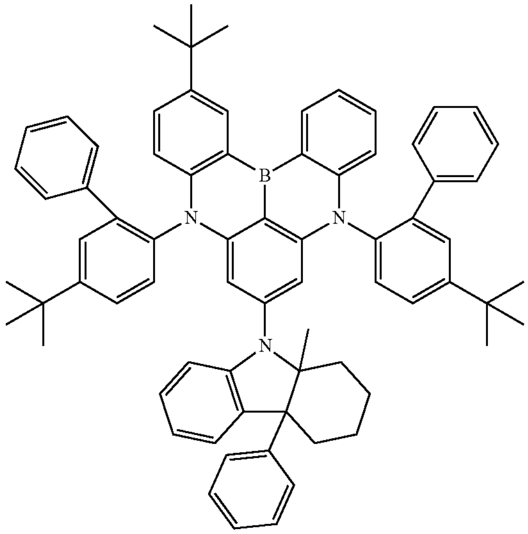
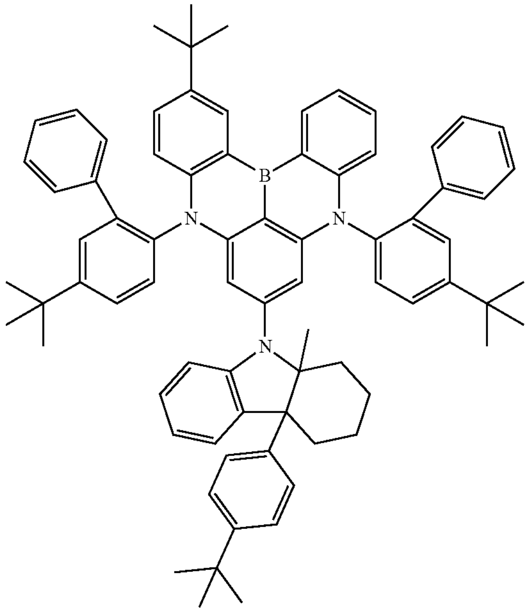

-continued
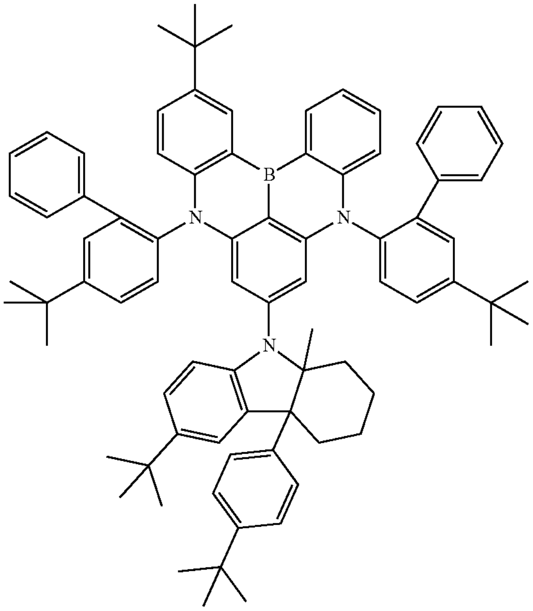
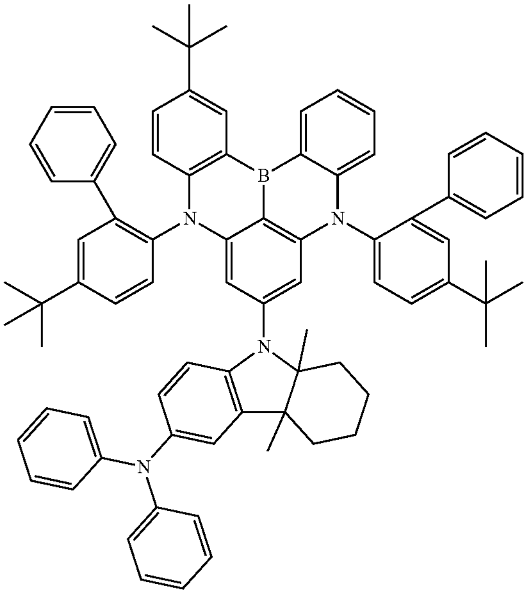
-continued
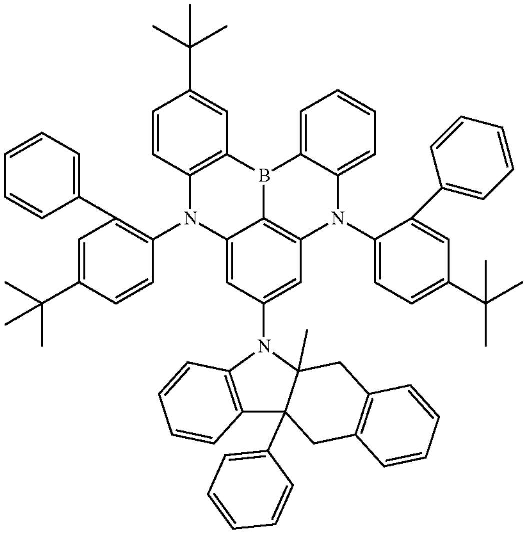
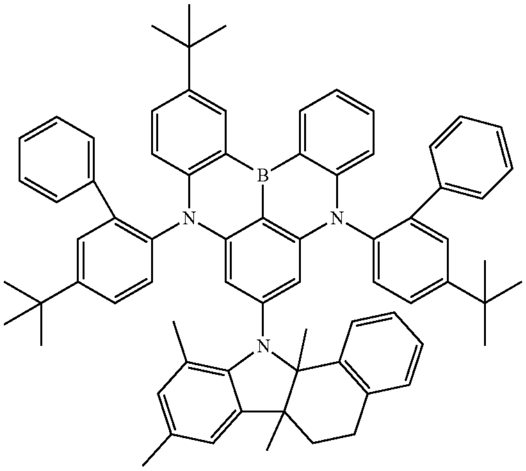
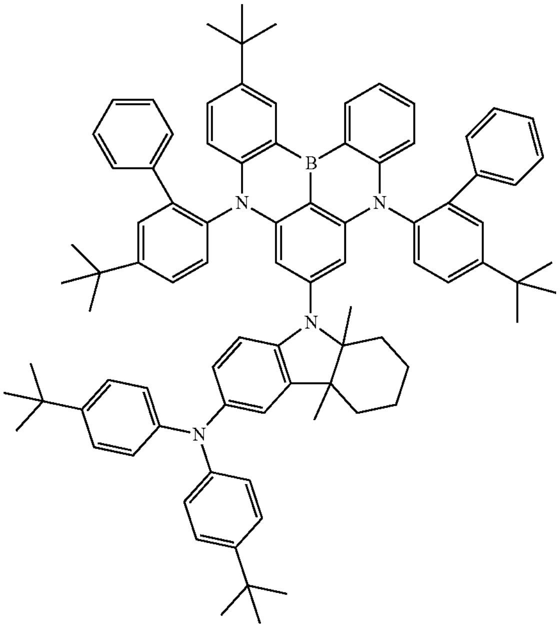

-continued
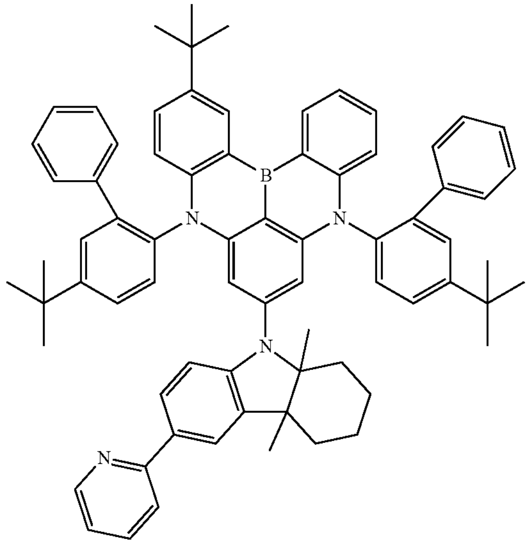
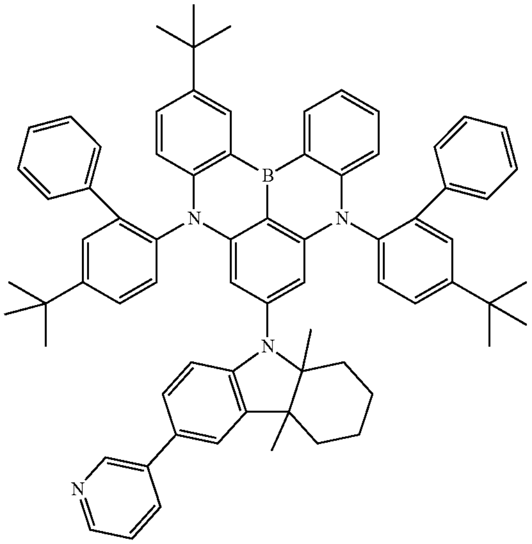
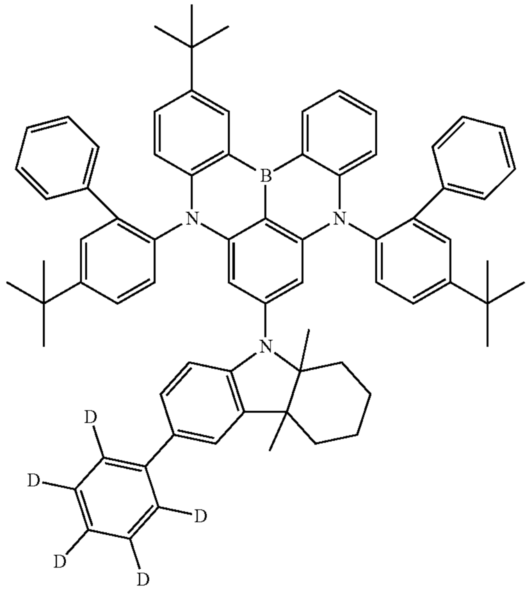
-continued
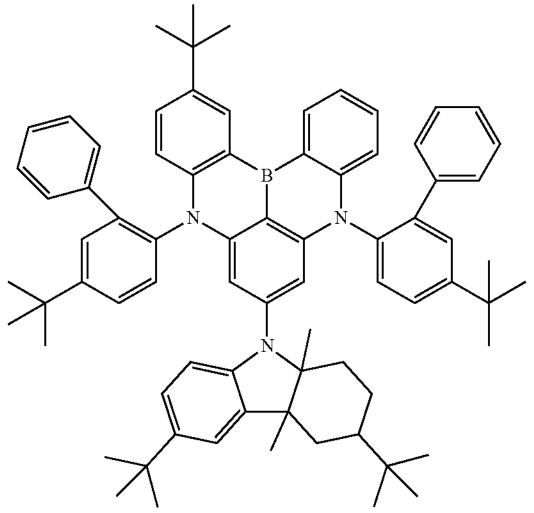
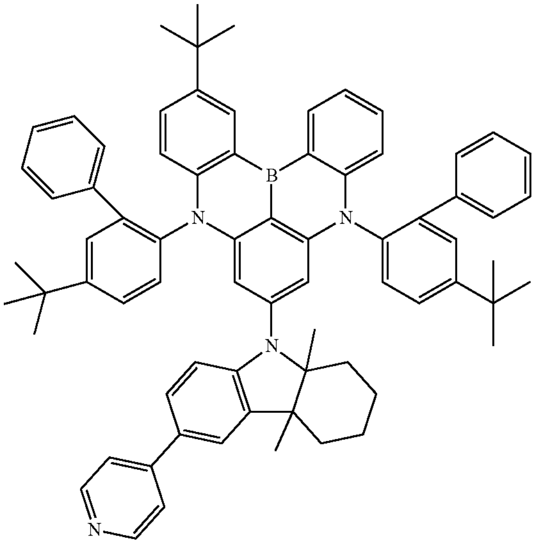
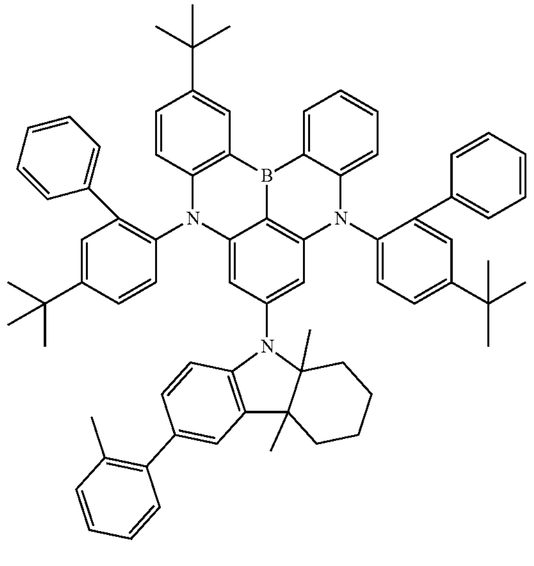

-continued
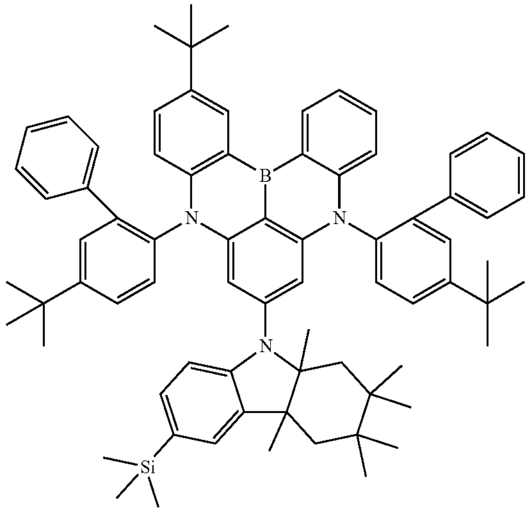
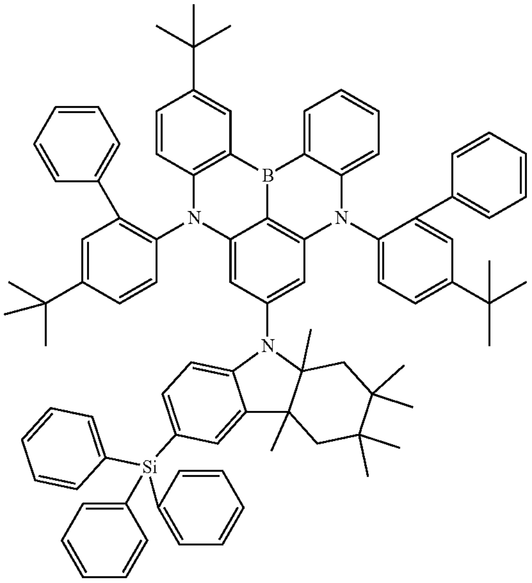
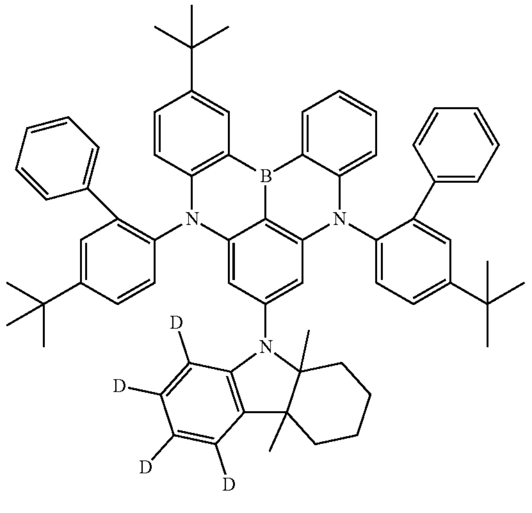
-continued
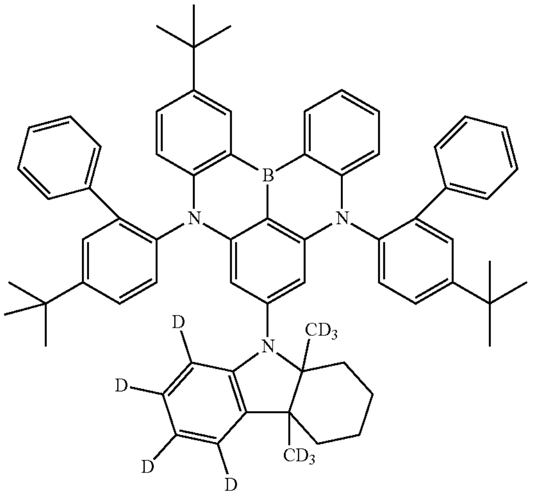
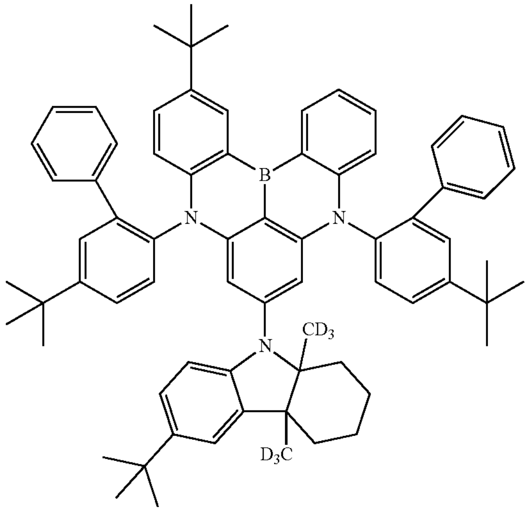
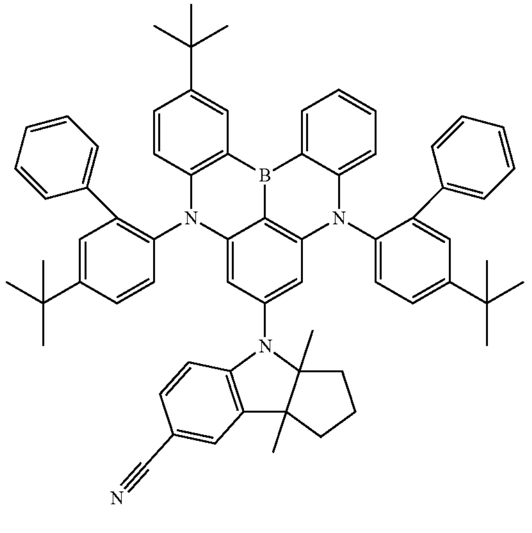

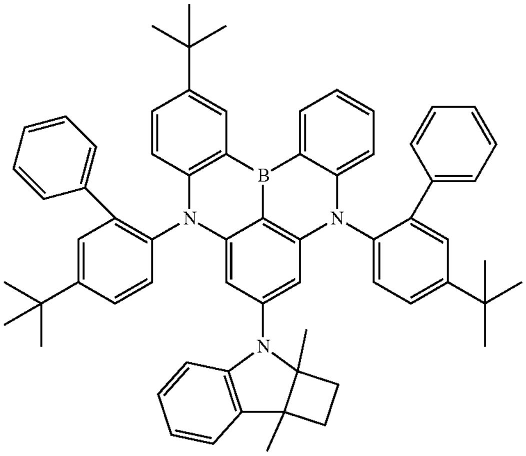
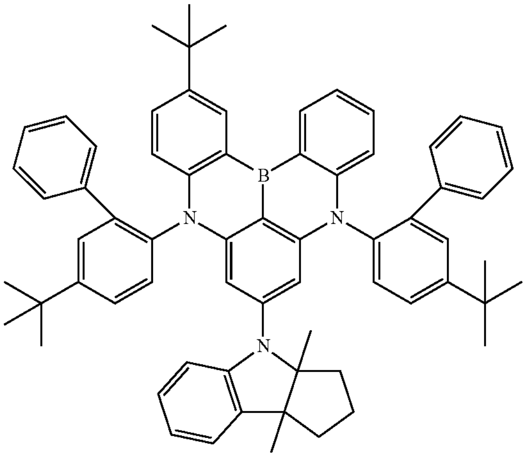
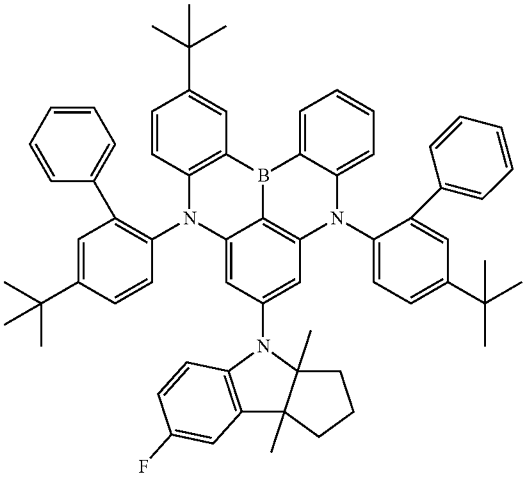
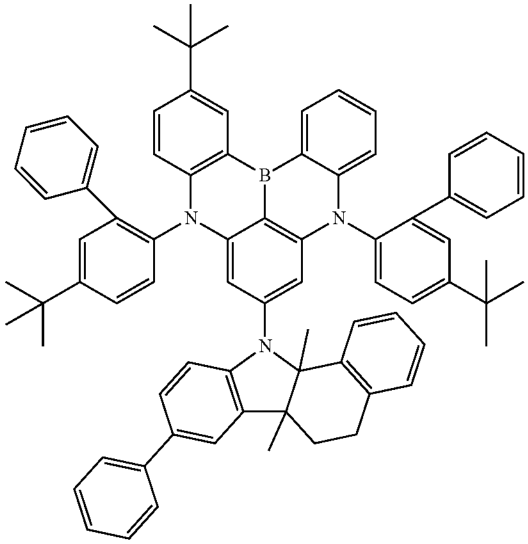
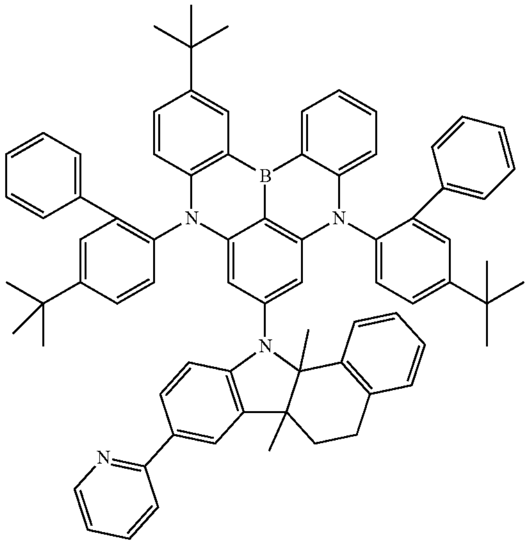
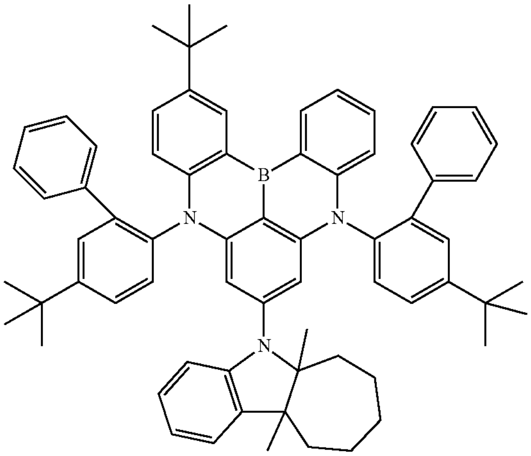

-continued
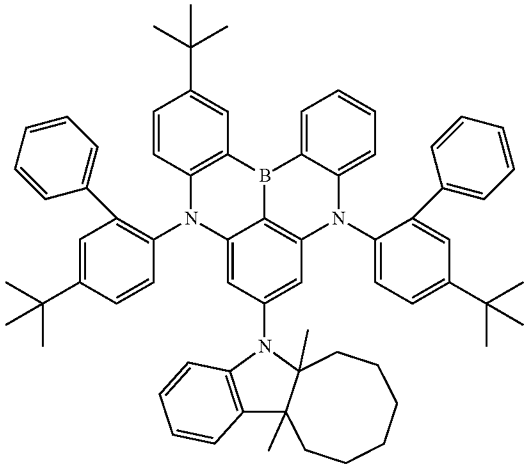
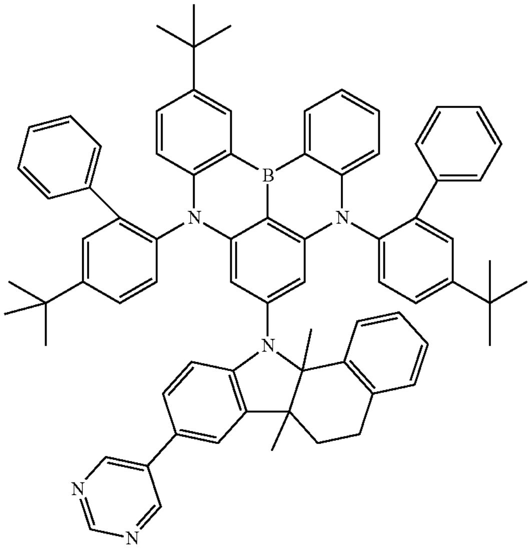
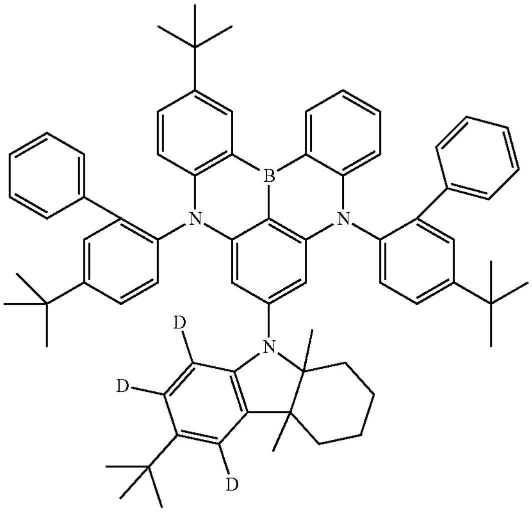
-continued
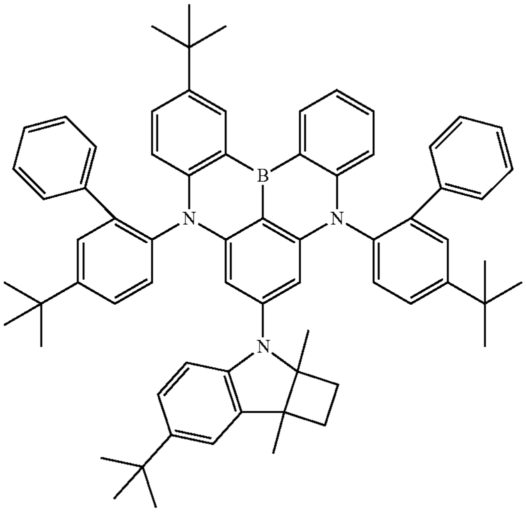
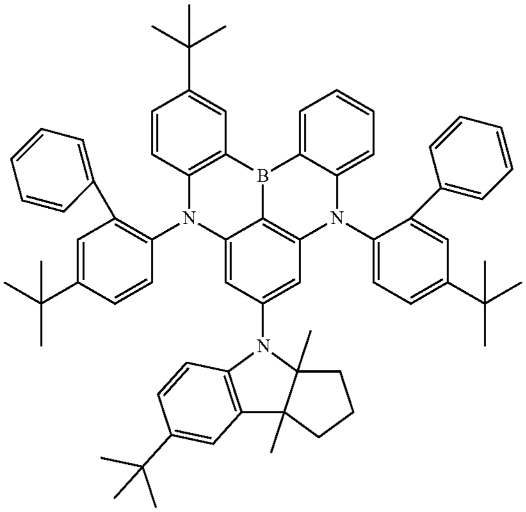
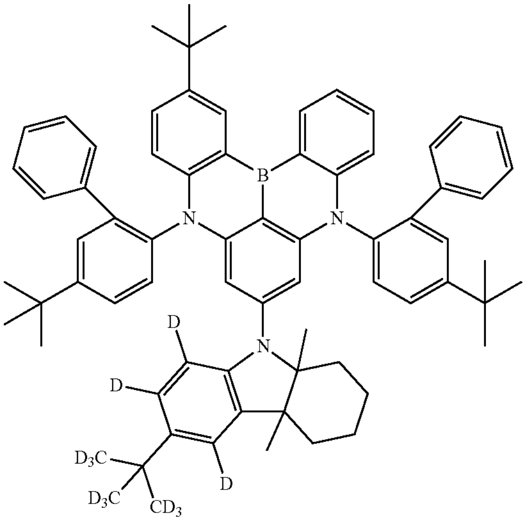

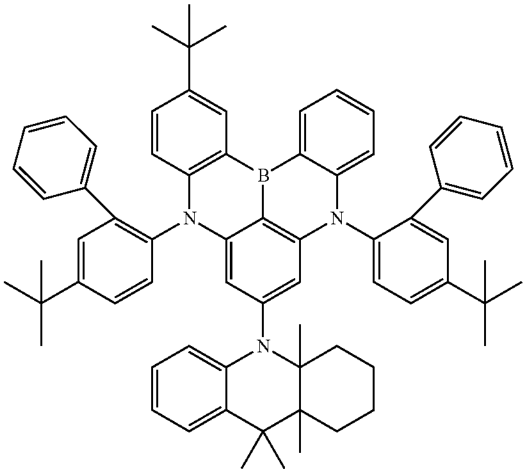
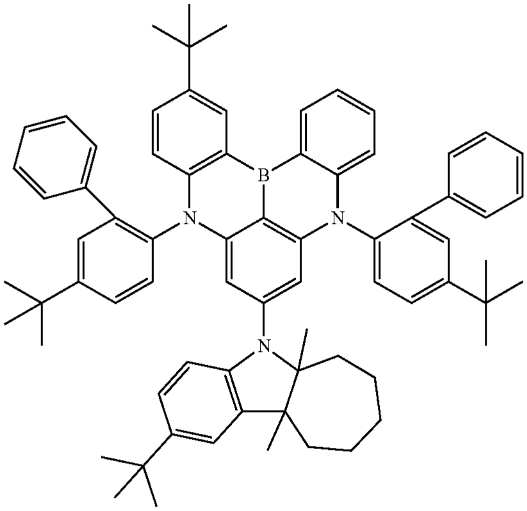
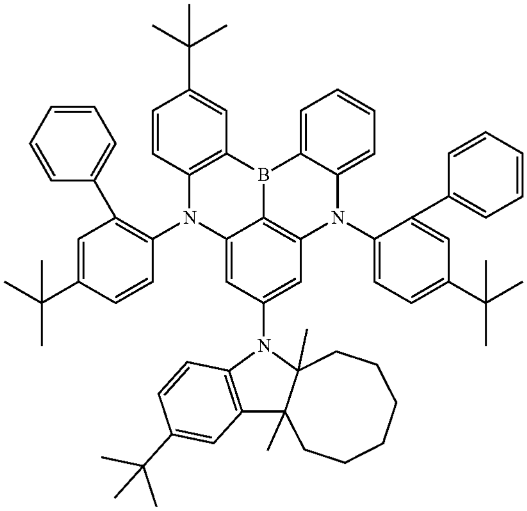
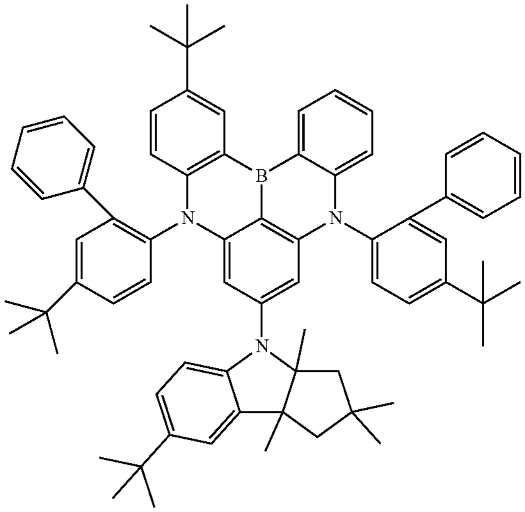
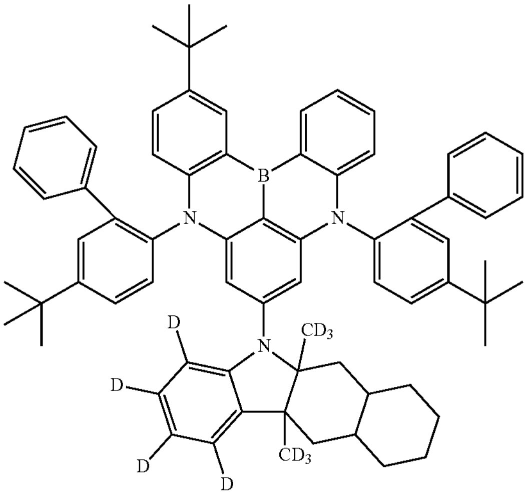
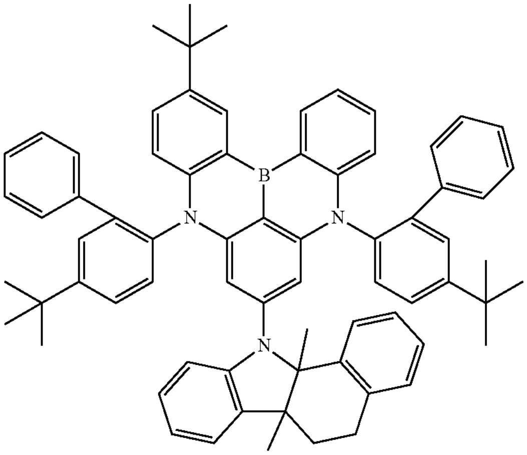

-continued
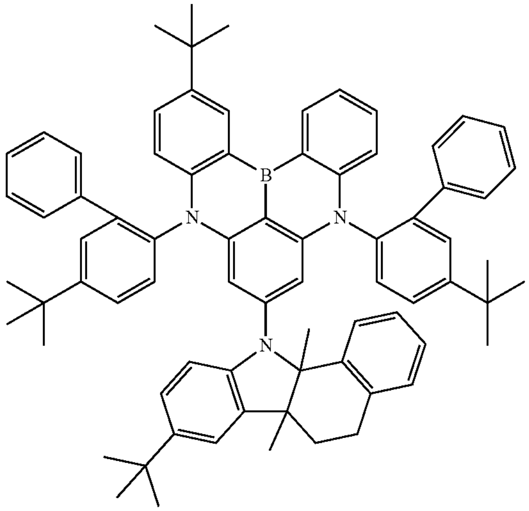
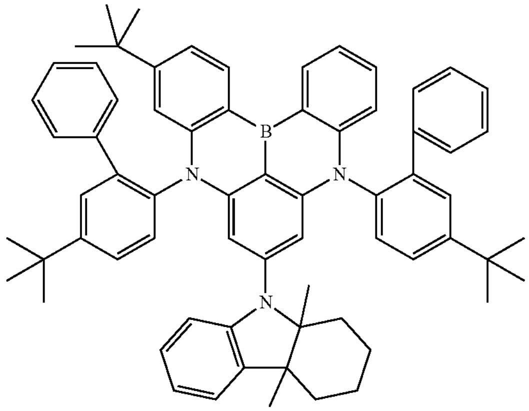
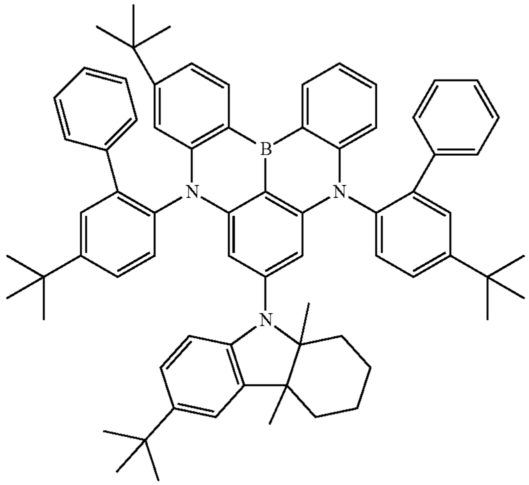
-continued
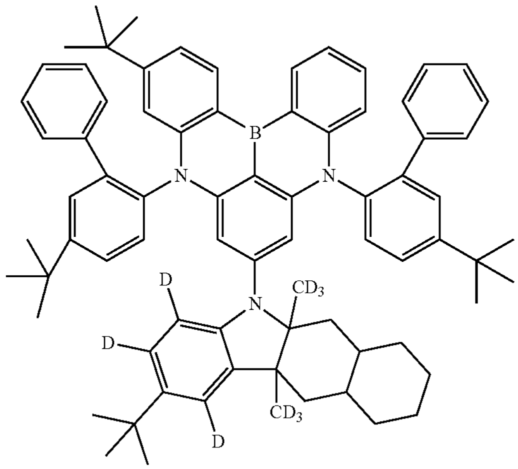
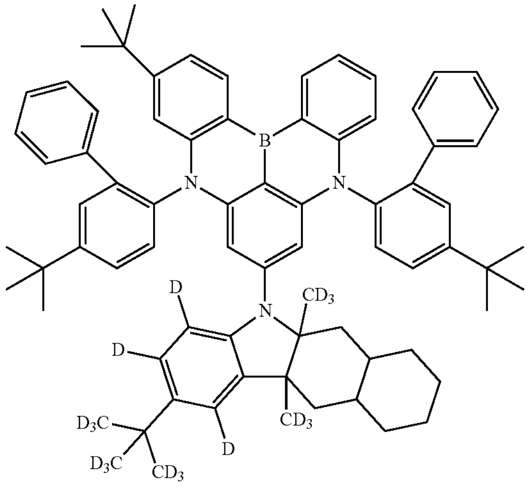
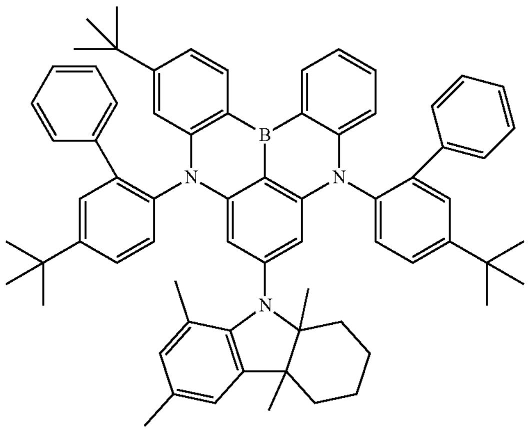

-continued
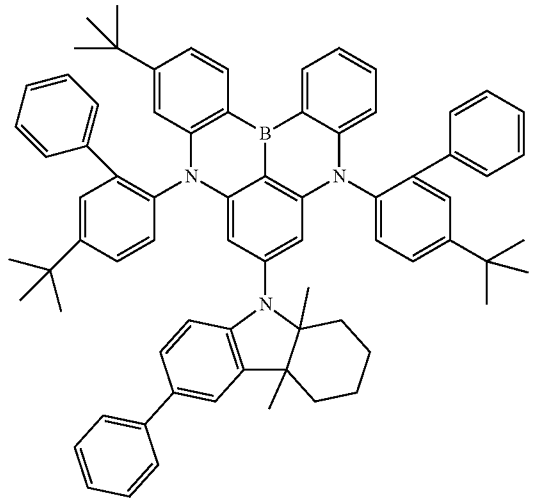
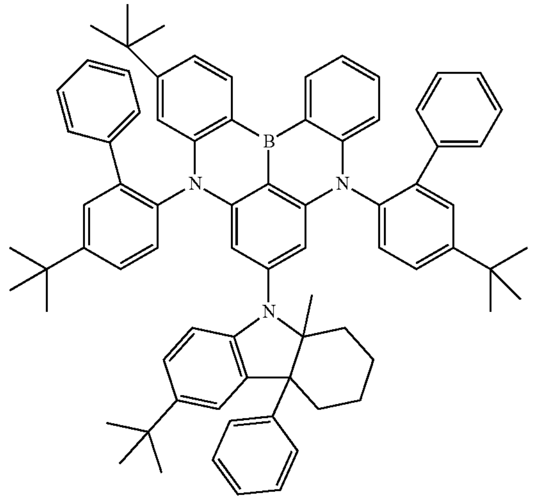
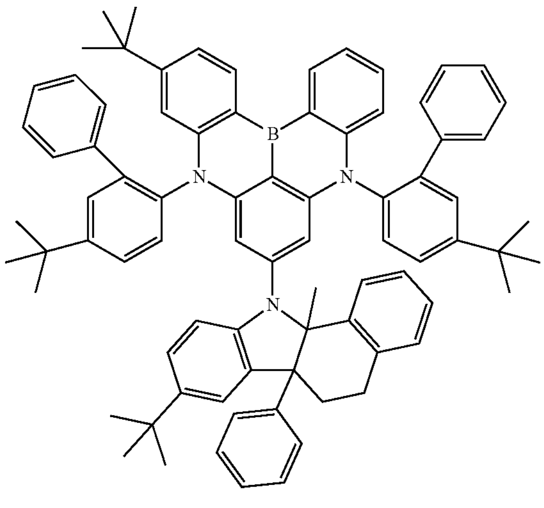
-continued
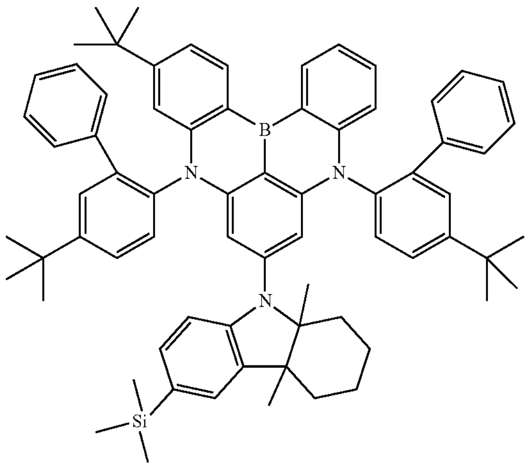
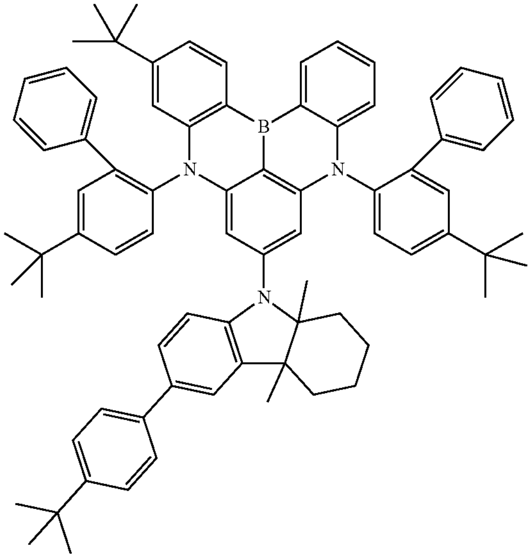
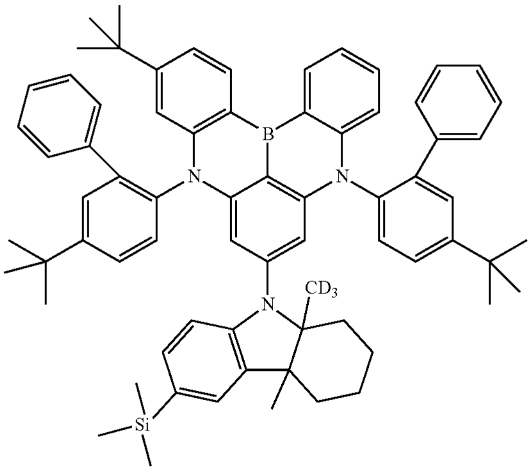

-continued
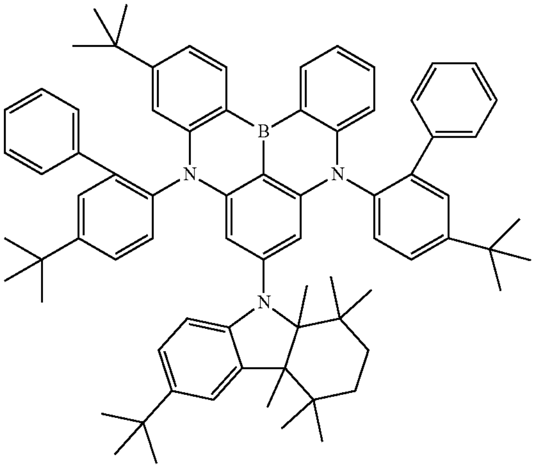
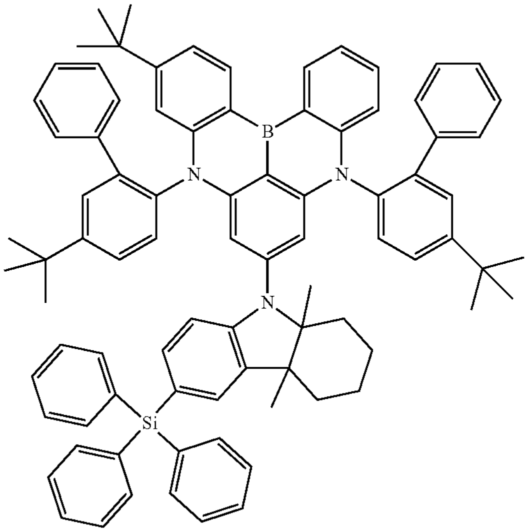
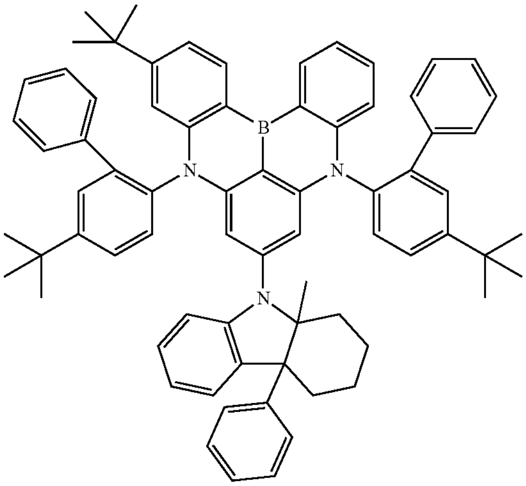
-continued
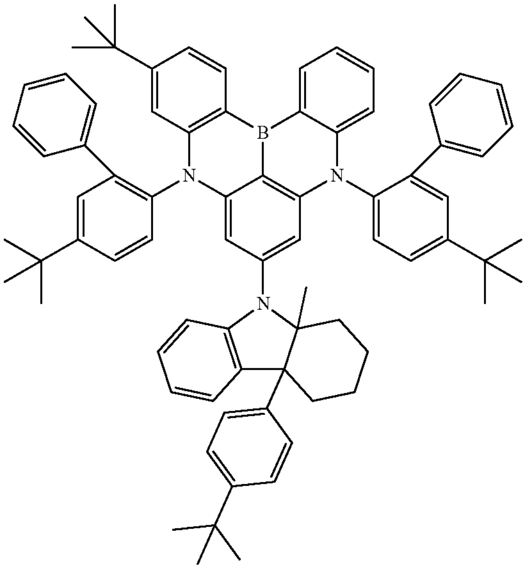
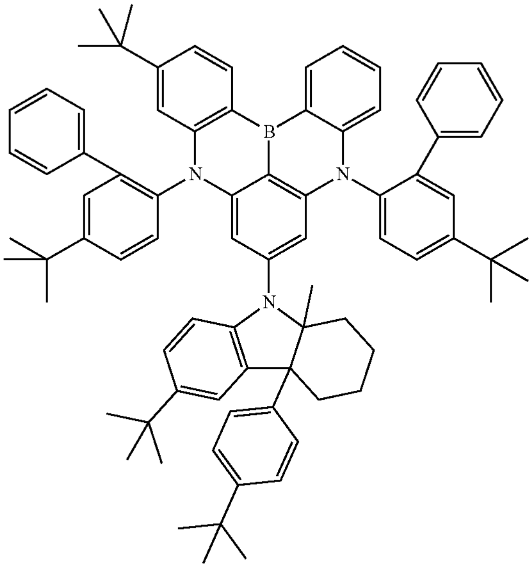
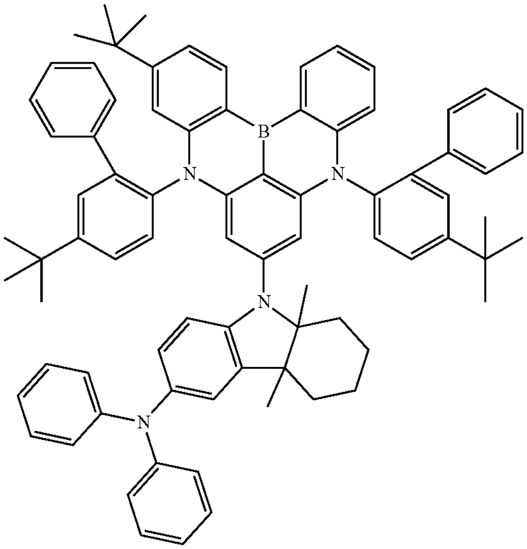

-continued
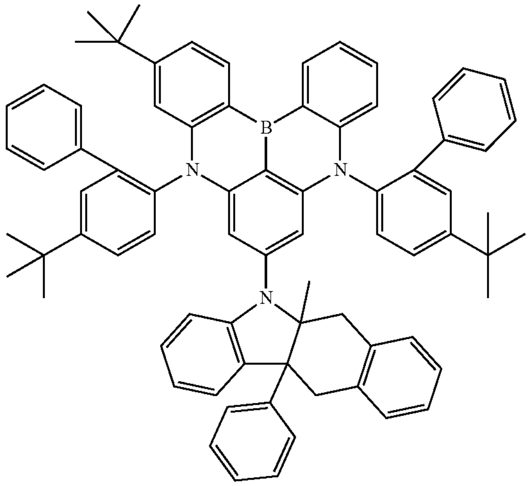
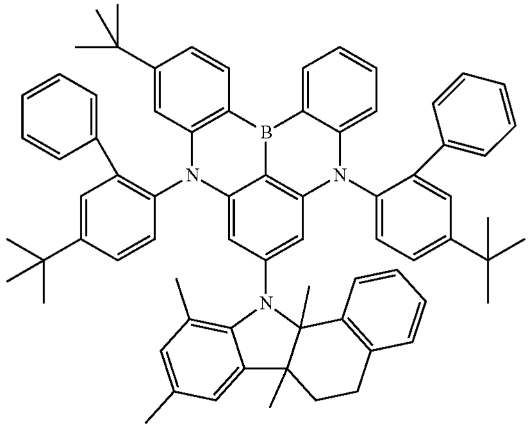
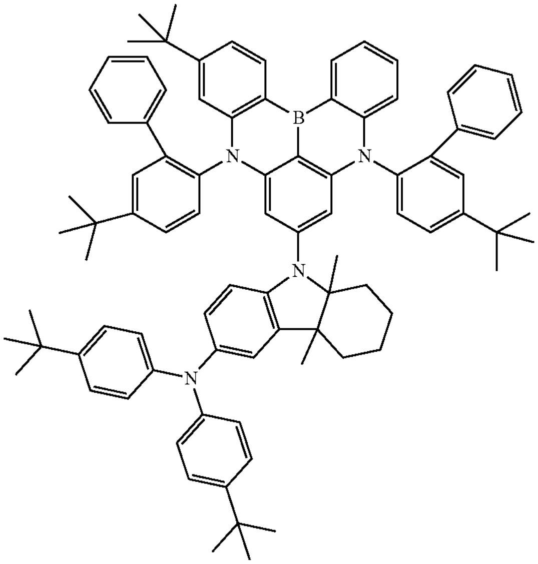
-continued
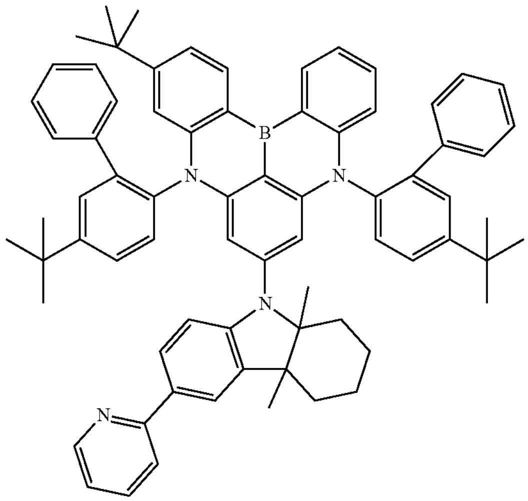
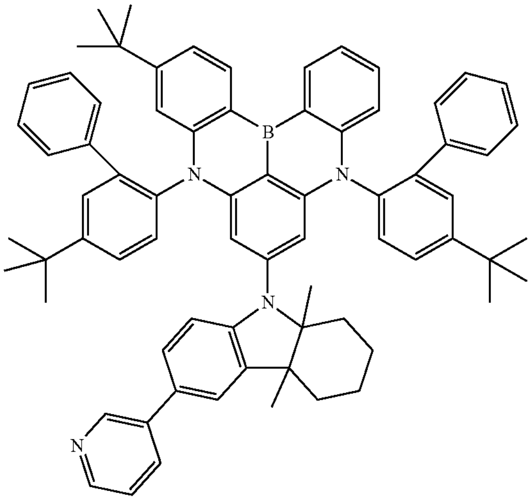
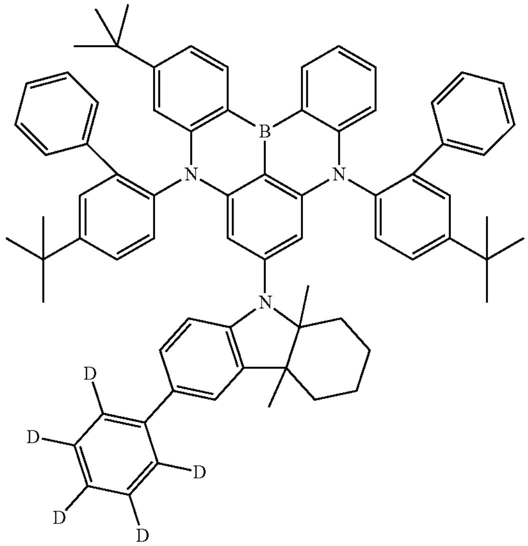

-continued
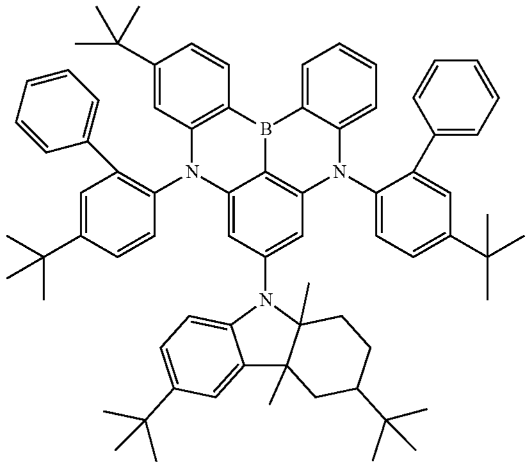
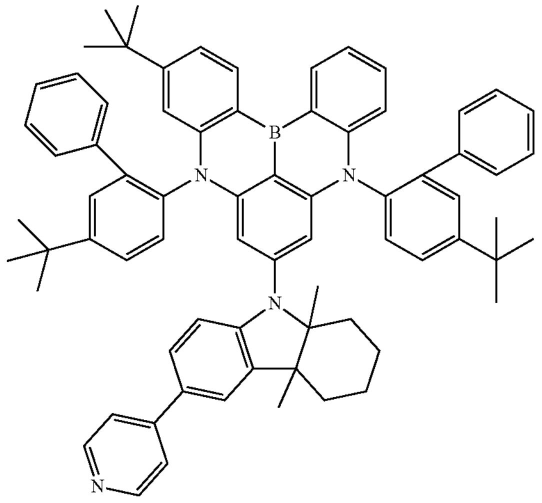
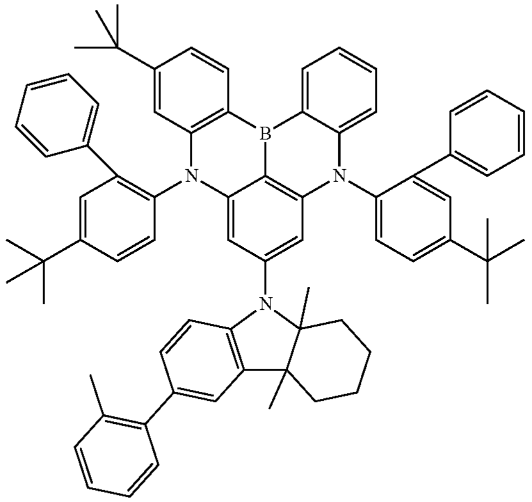
-continued
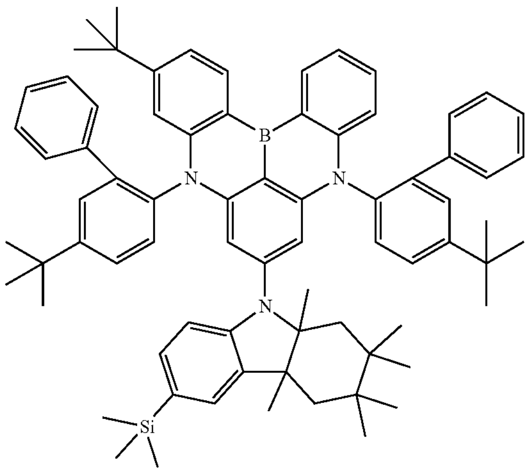
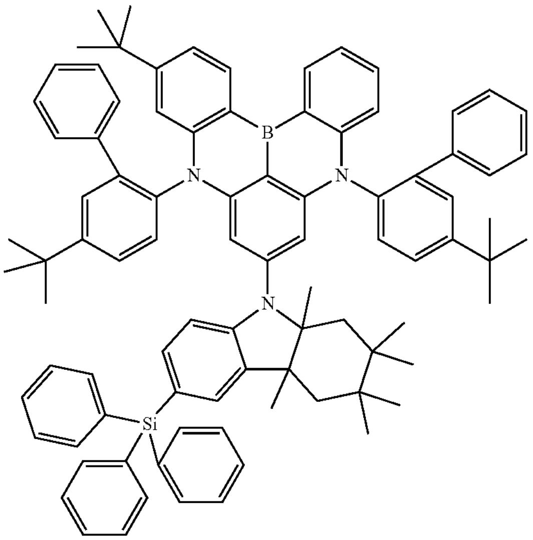
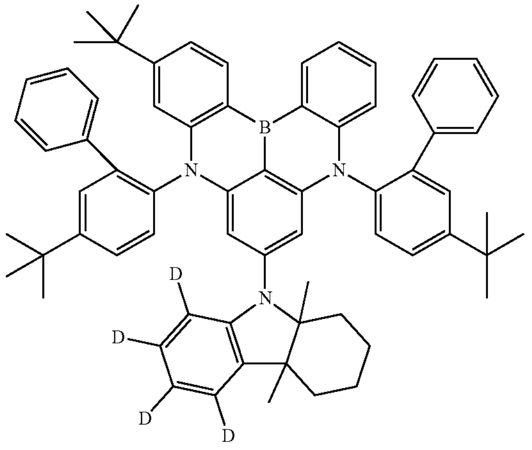

-continued
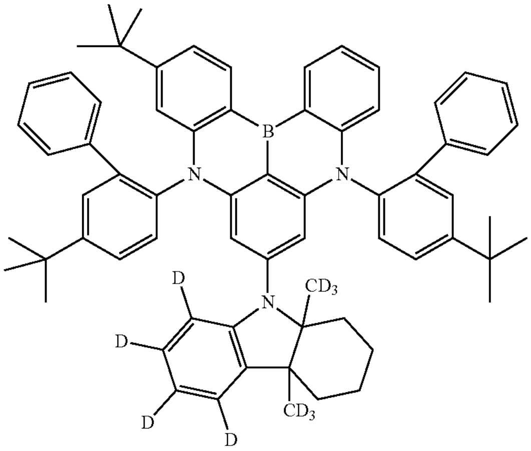
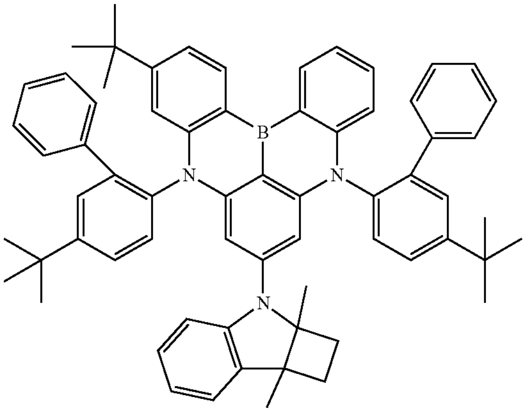
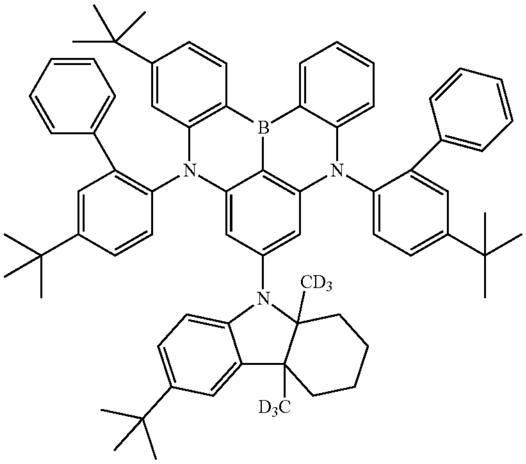
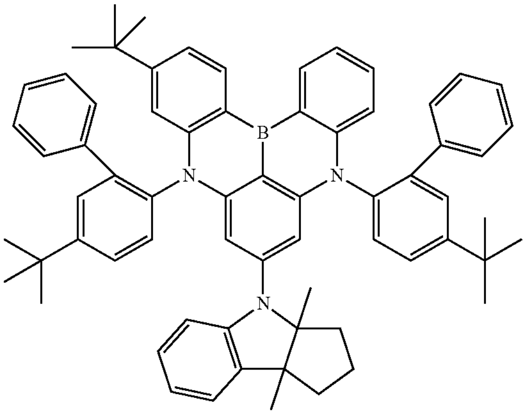
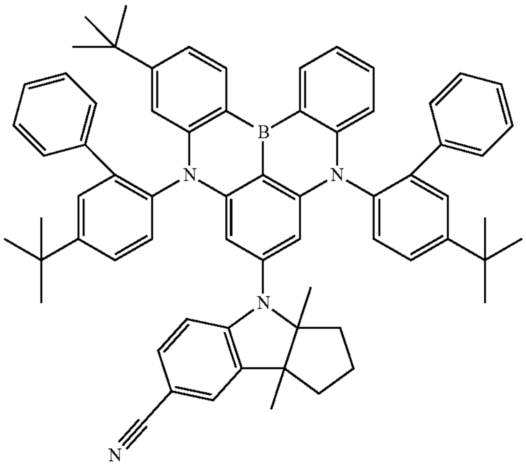
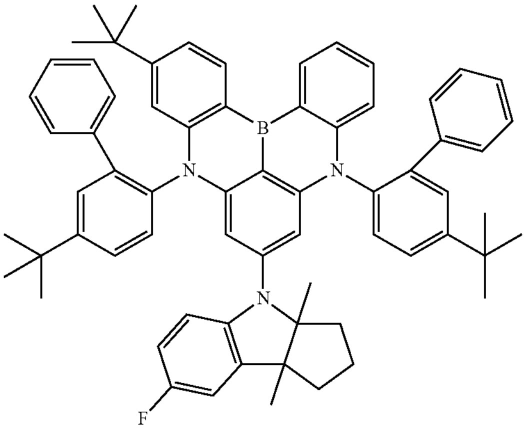
-continued -continued
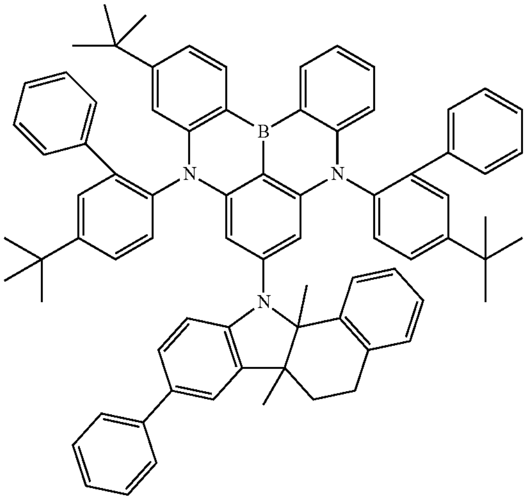
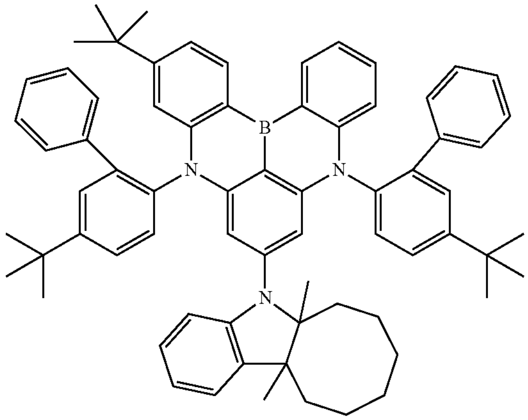
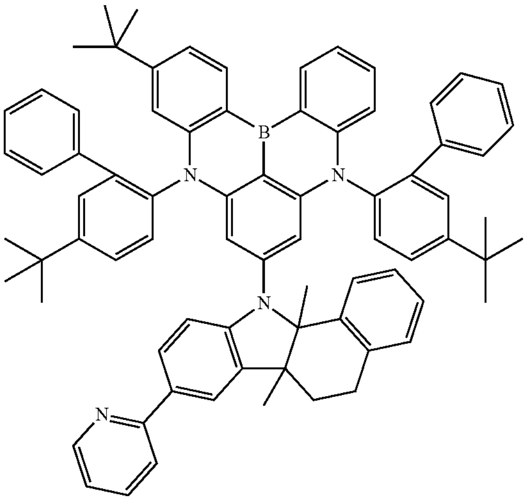
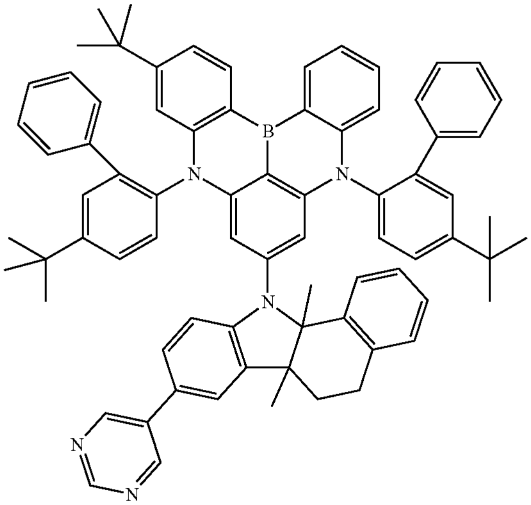
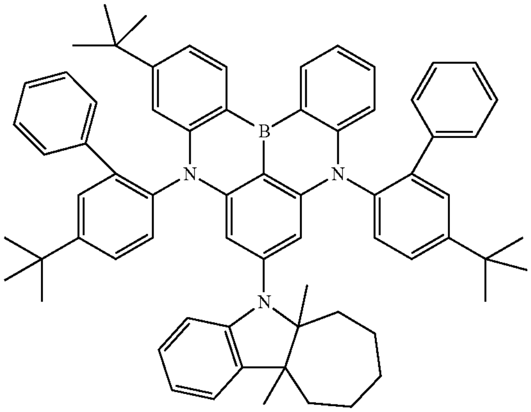
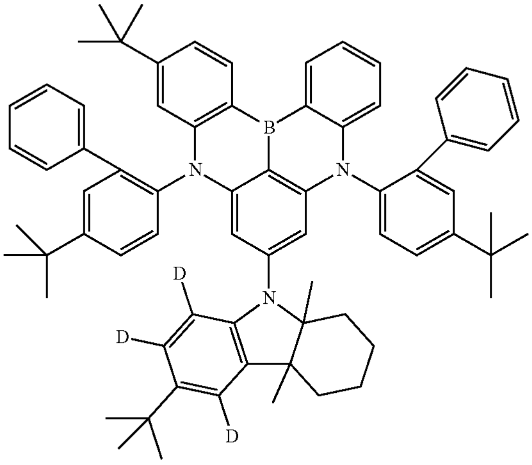

-continued
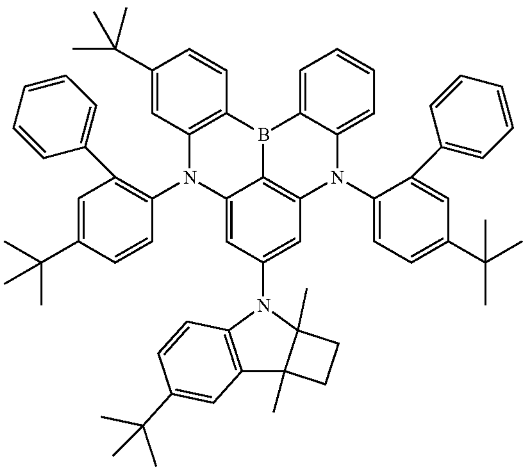
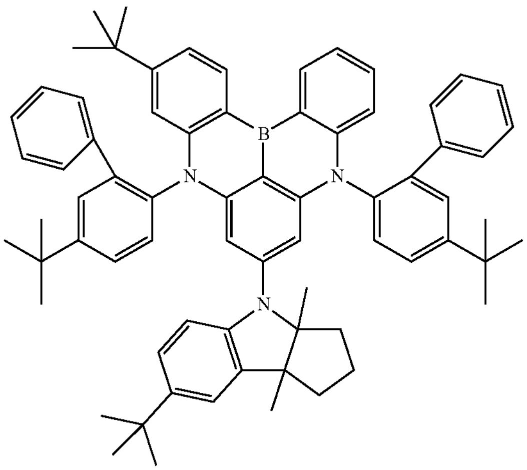
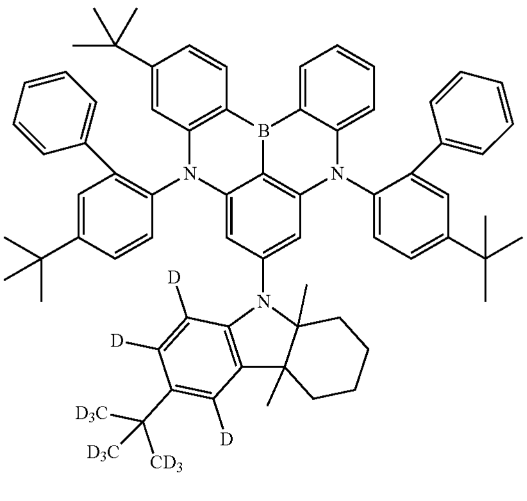
-continued
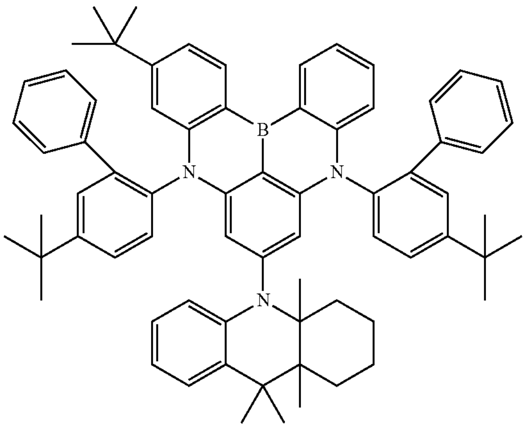
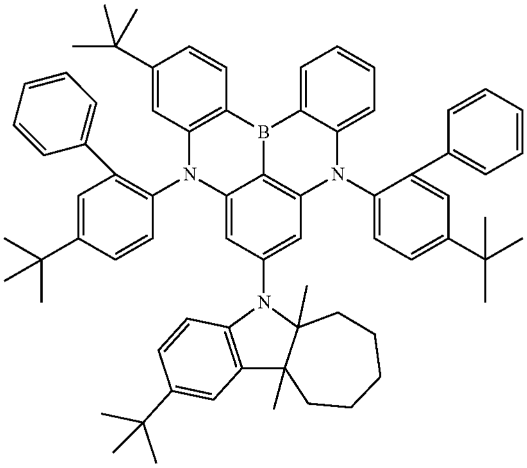
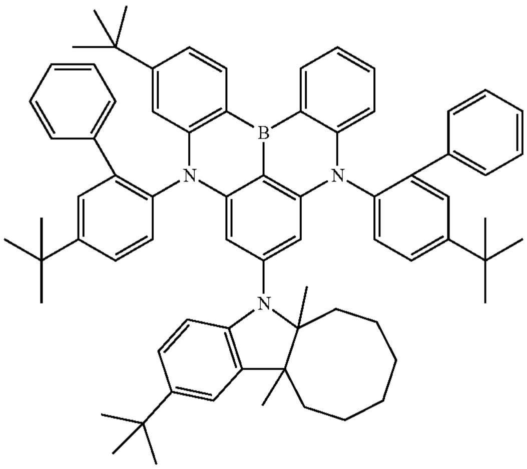

-continued
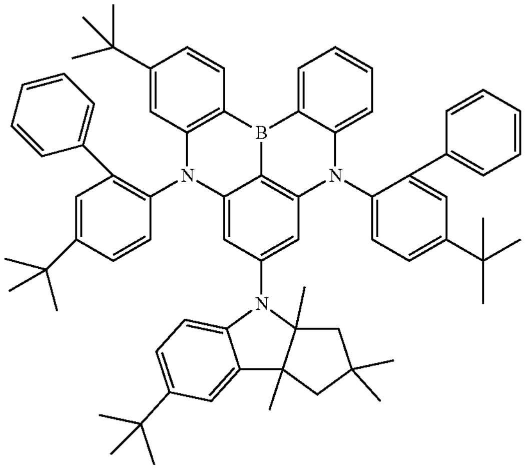
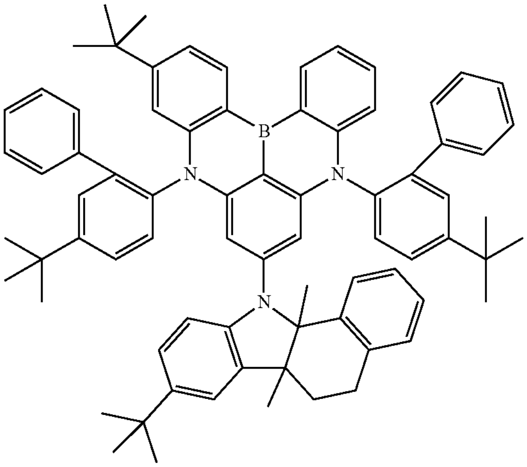
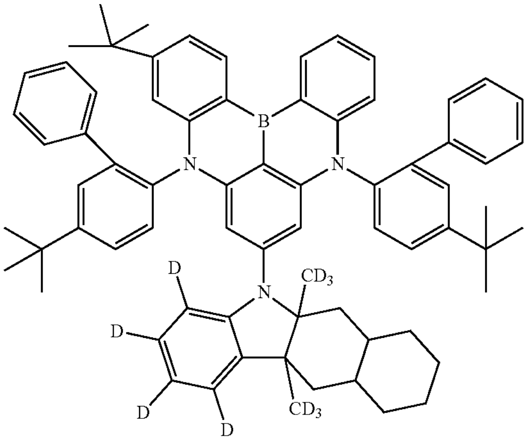
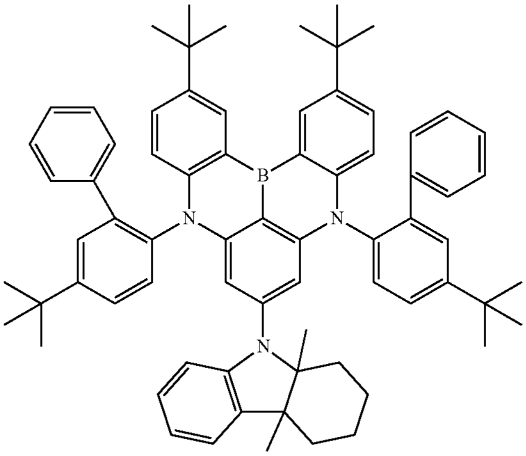
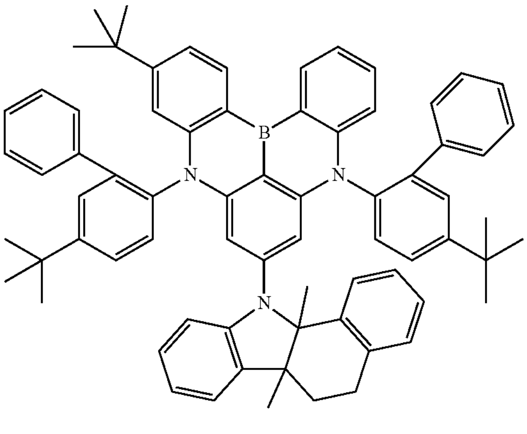
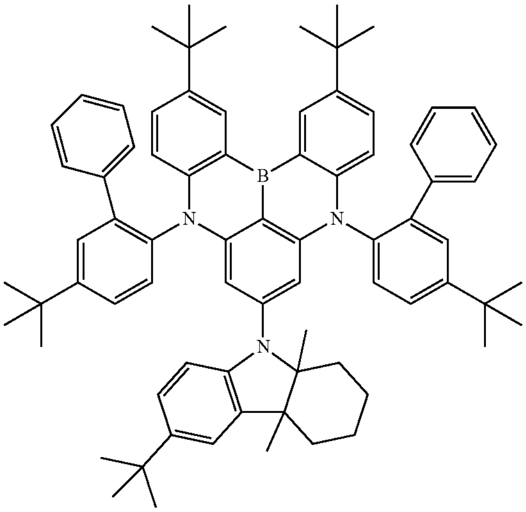
-continued -continued
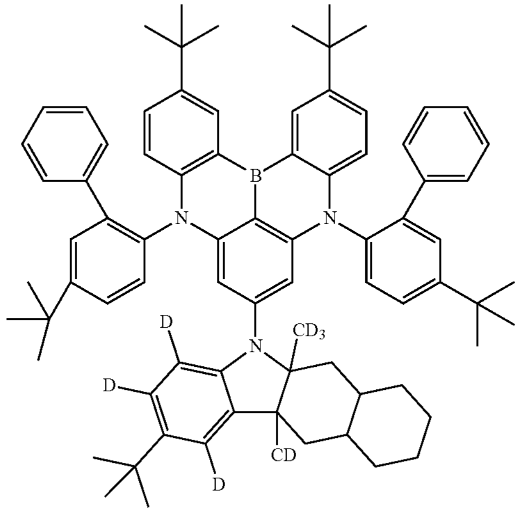
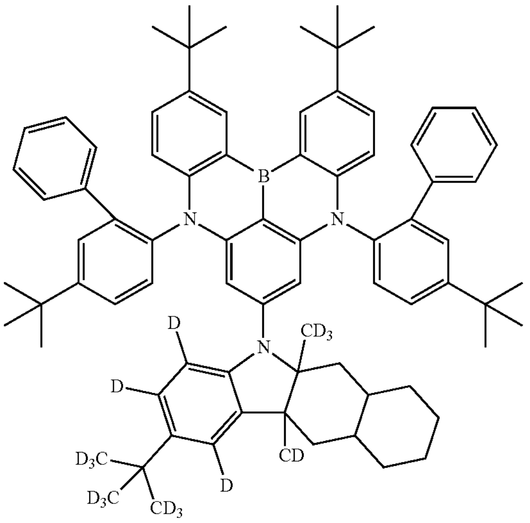
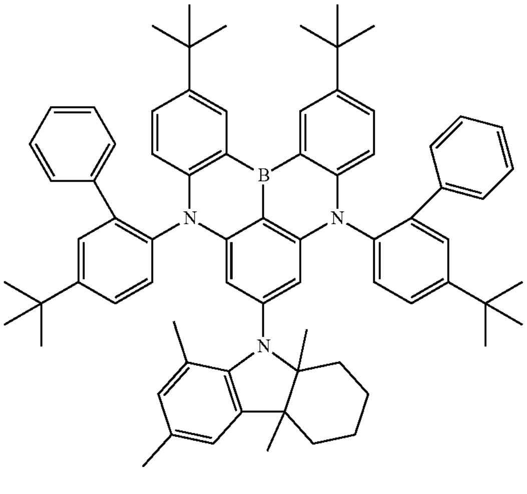
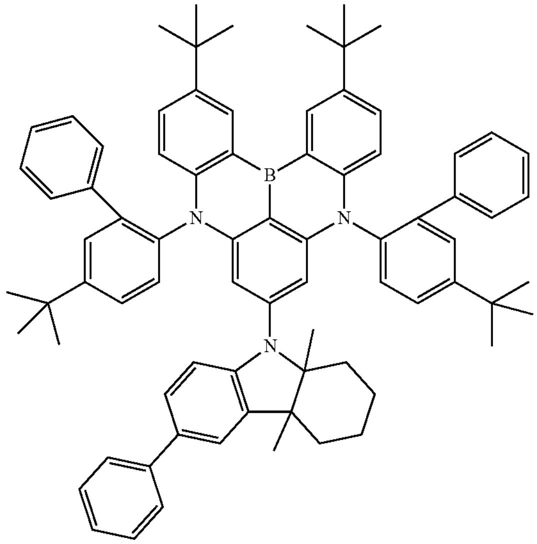
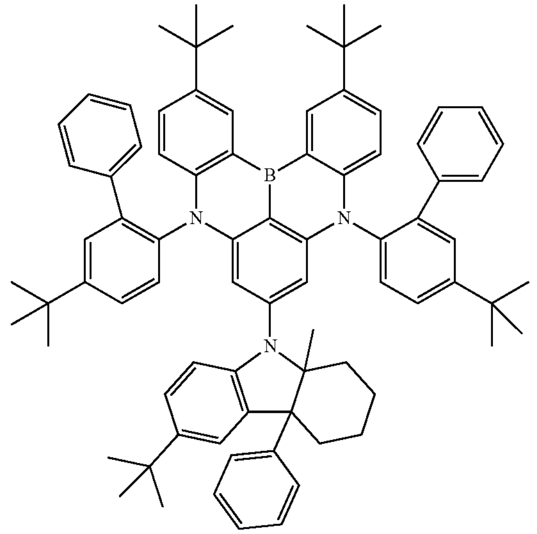
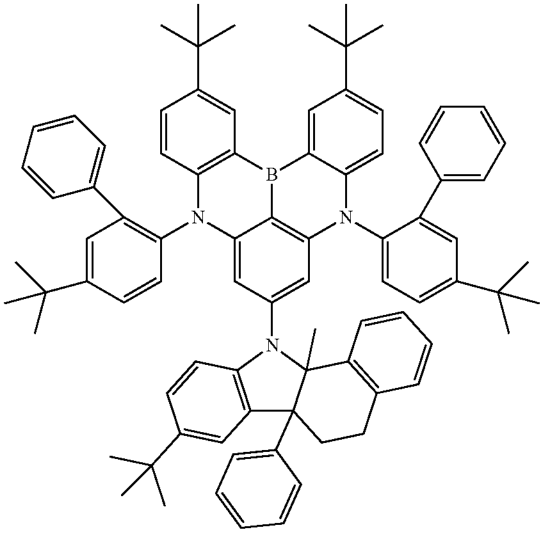
-continued -continued
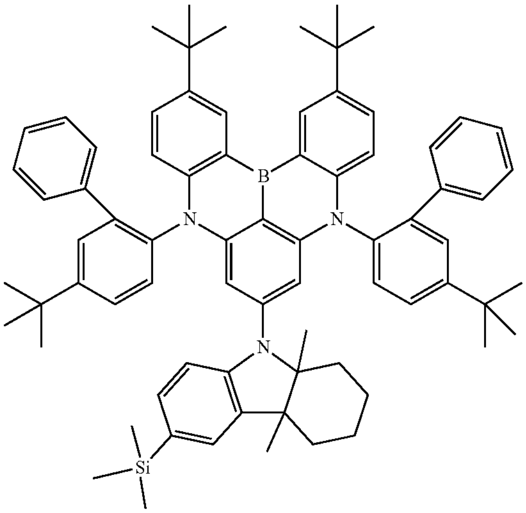
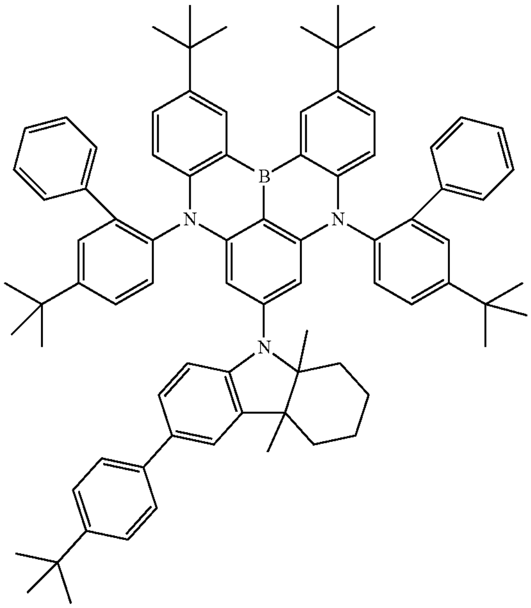
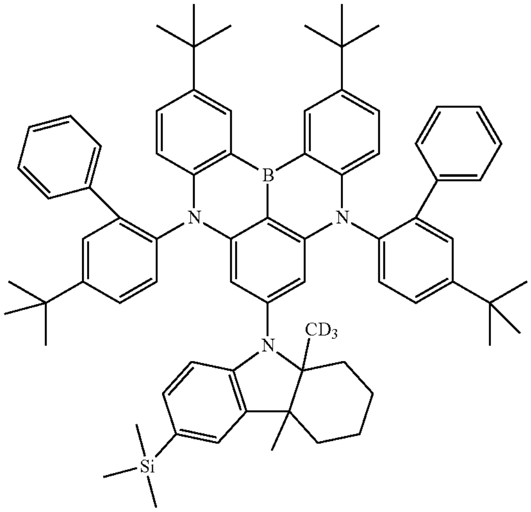
-continued
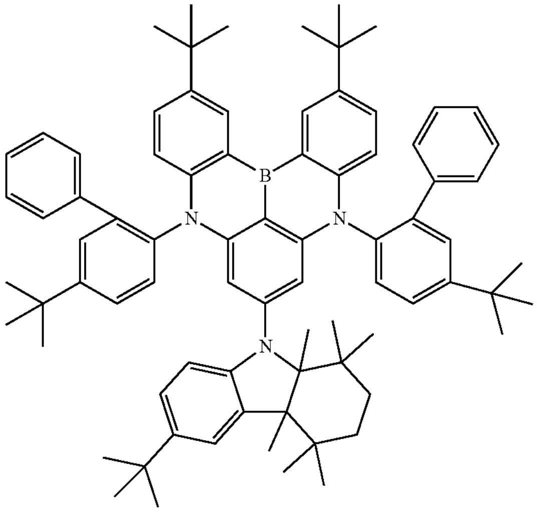
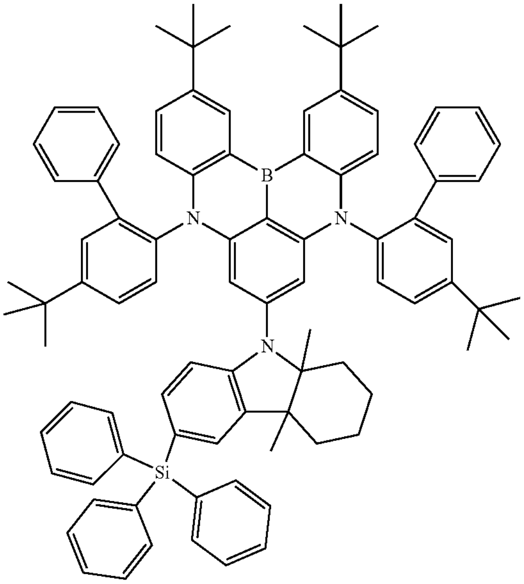
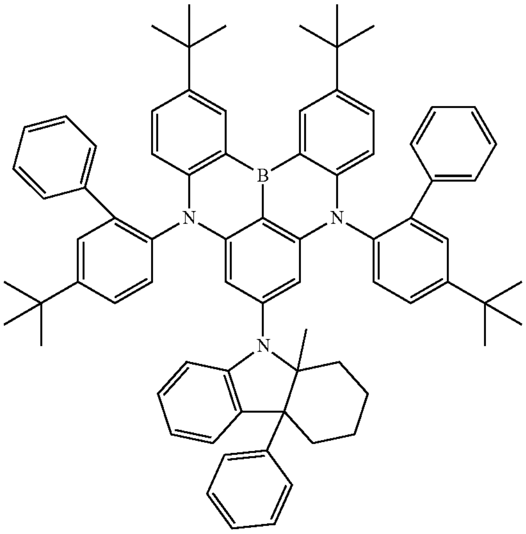

-continued
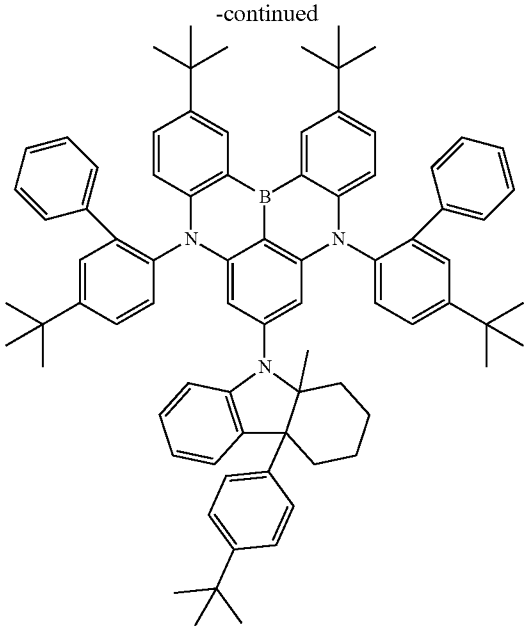
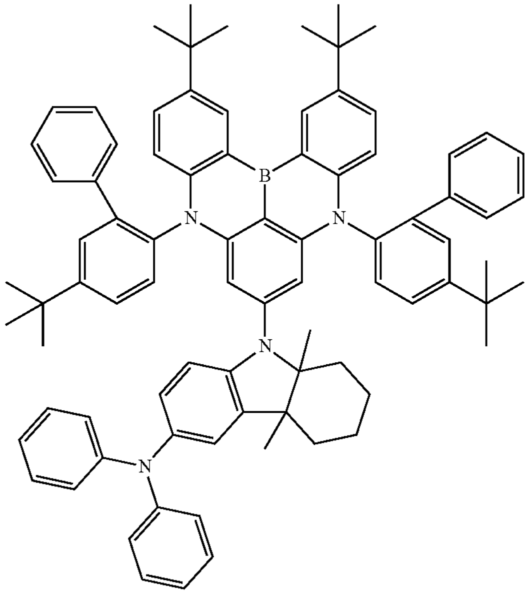
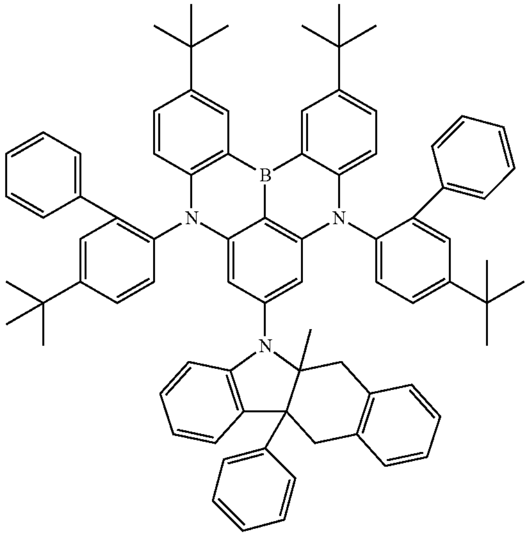
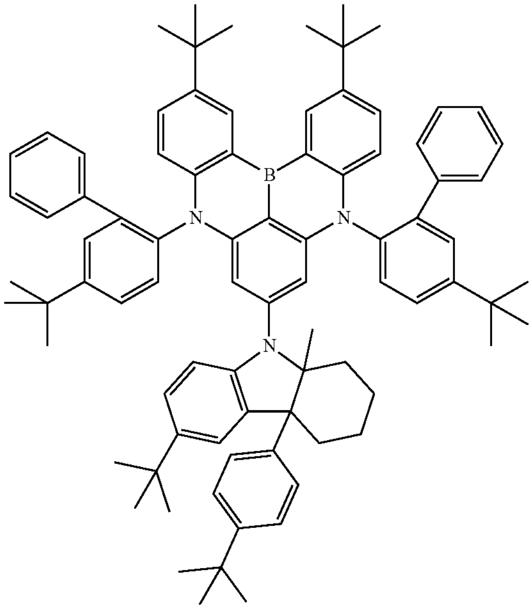
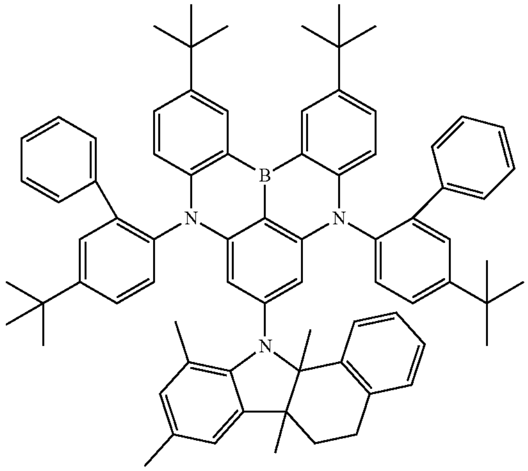

-continued
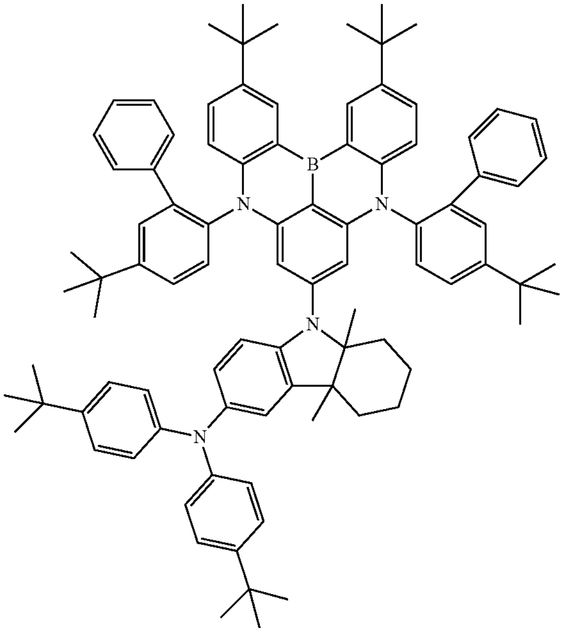
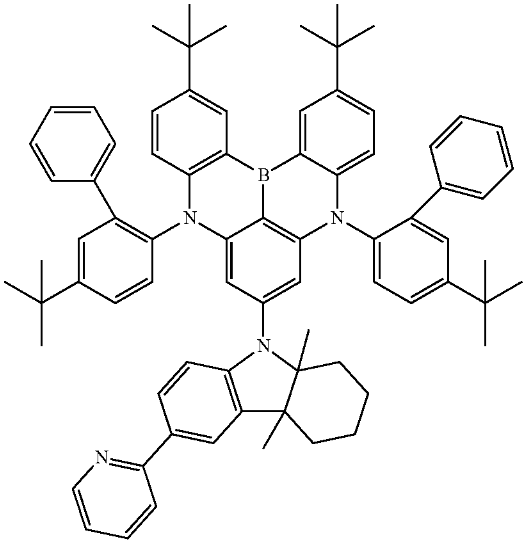
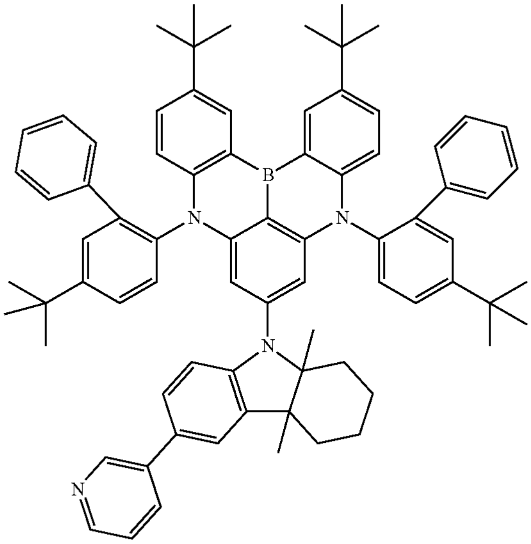
-continued
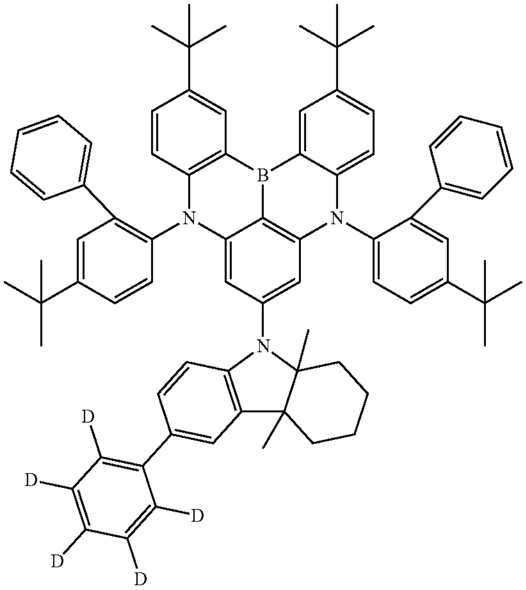
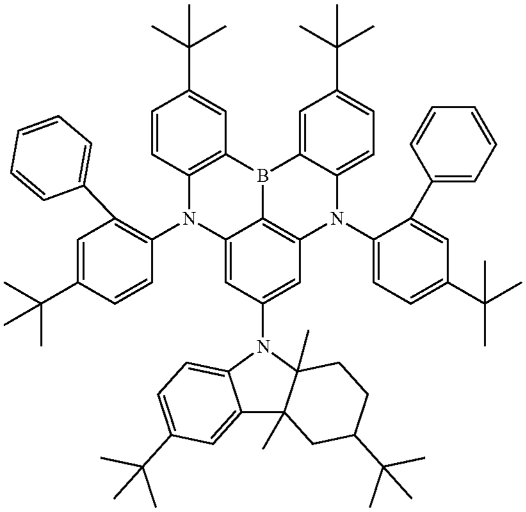
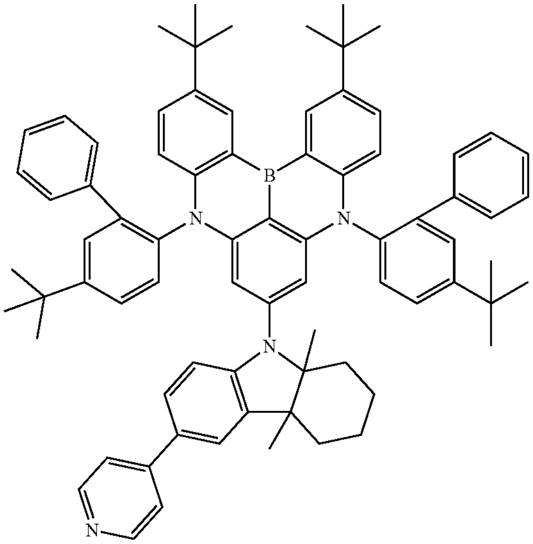

-continued
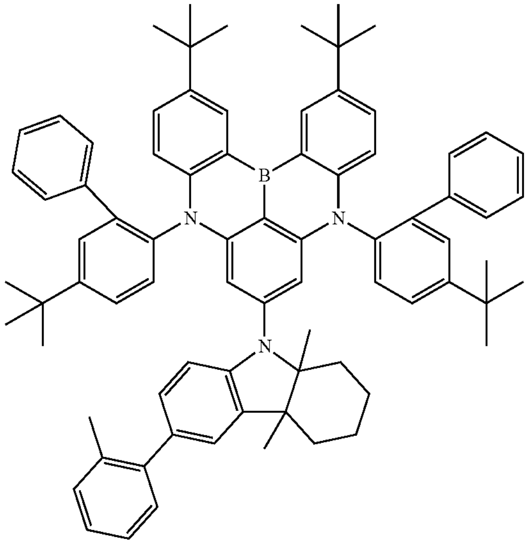
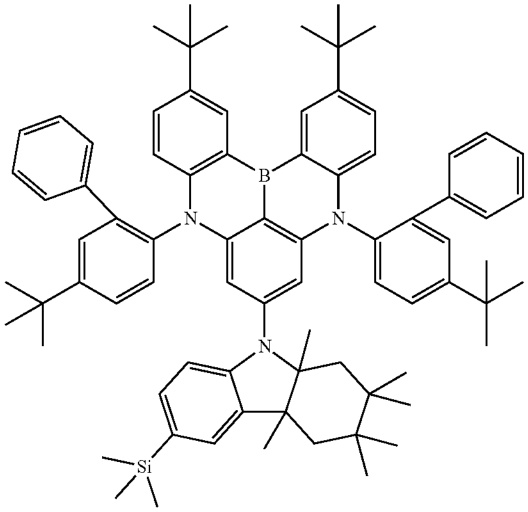
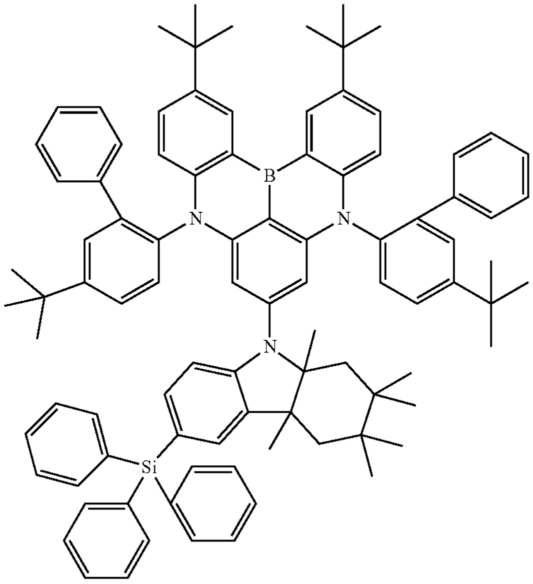
-continued
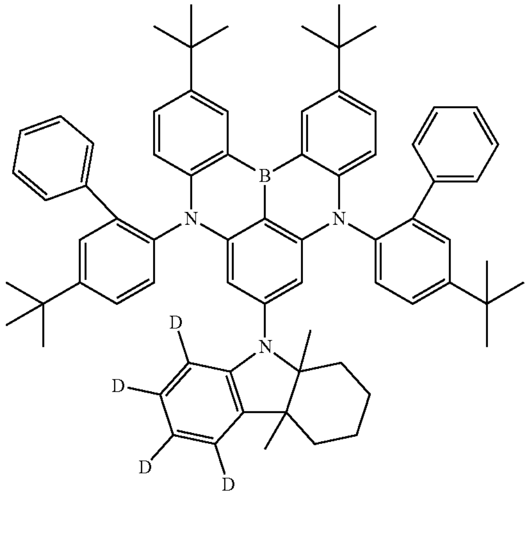
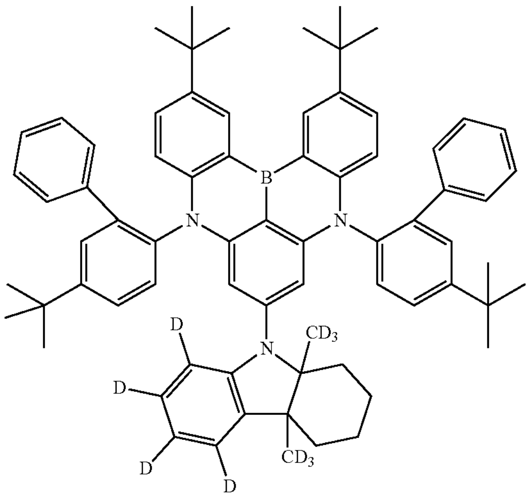
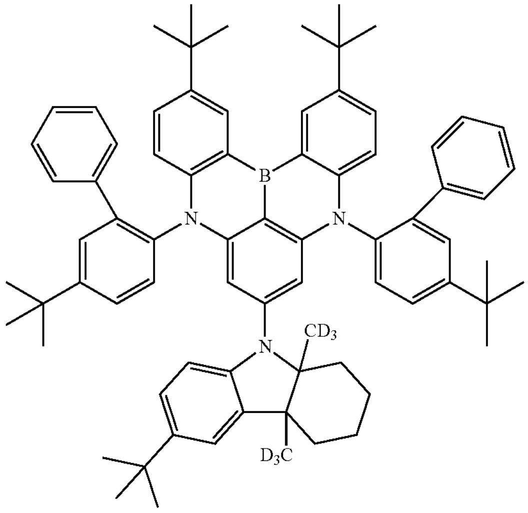

-continued
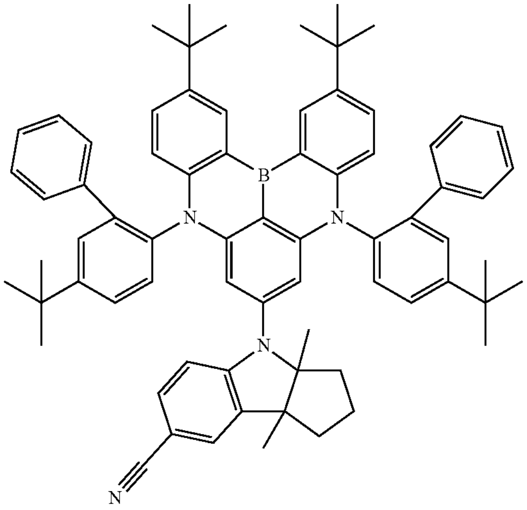
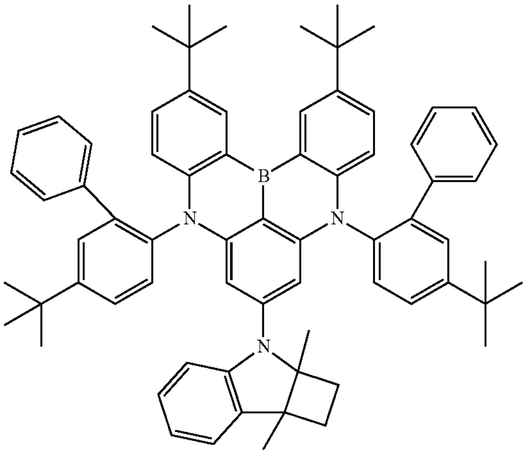
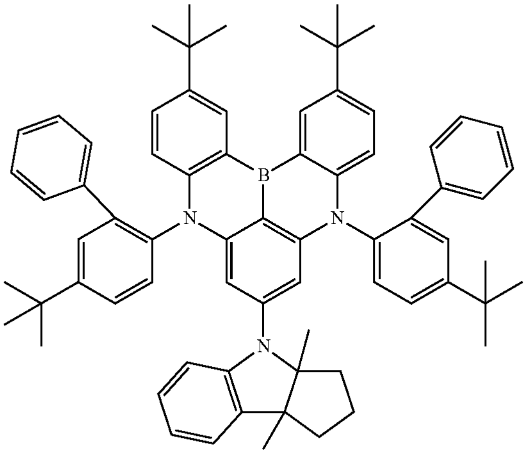
-continued
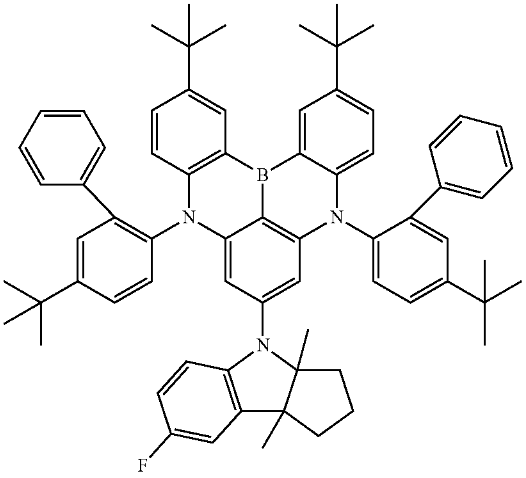
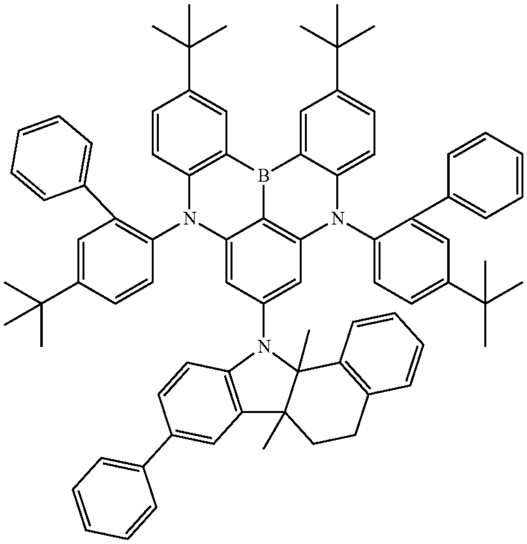
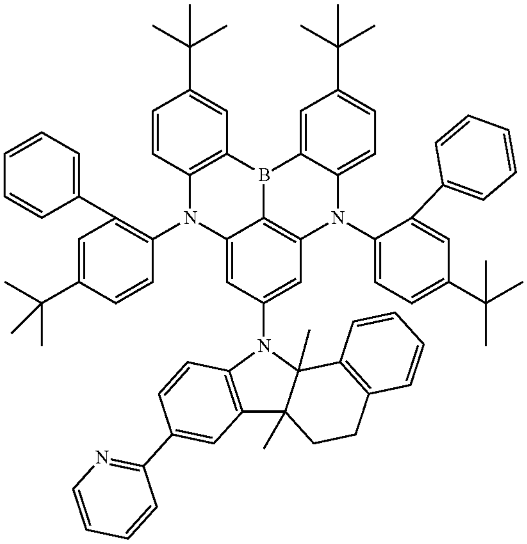

-continued
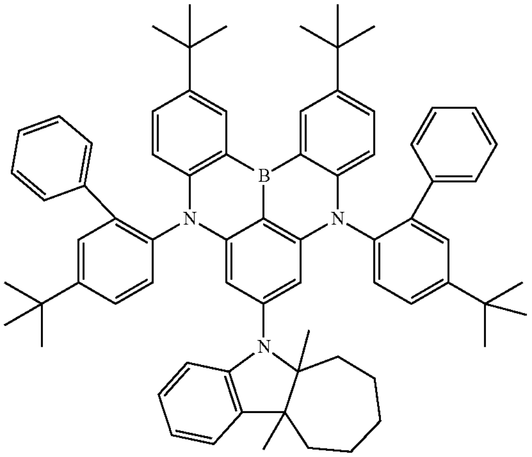
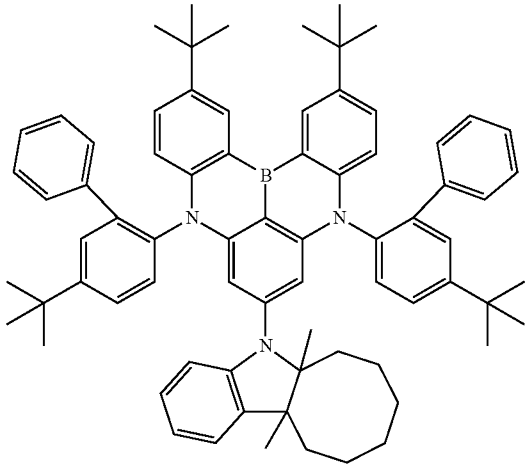
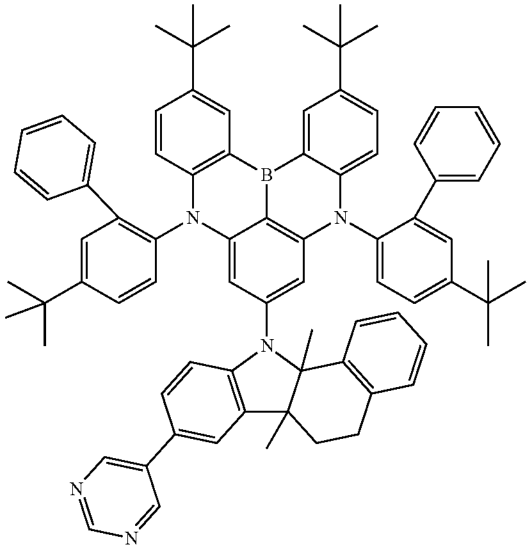
-continued
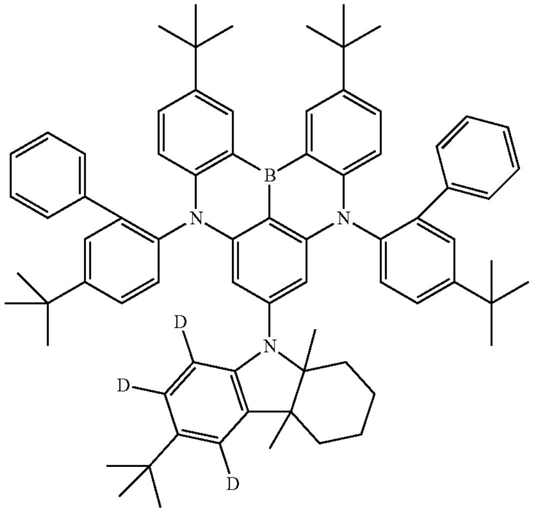
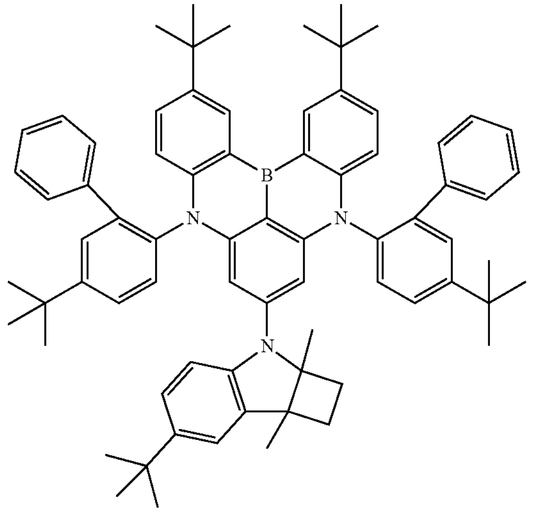
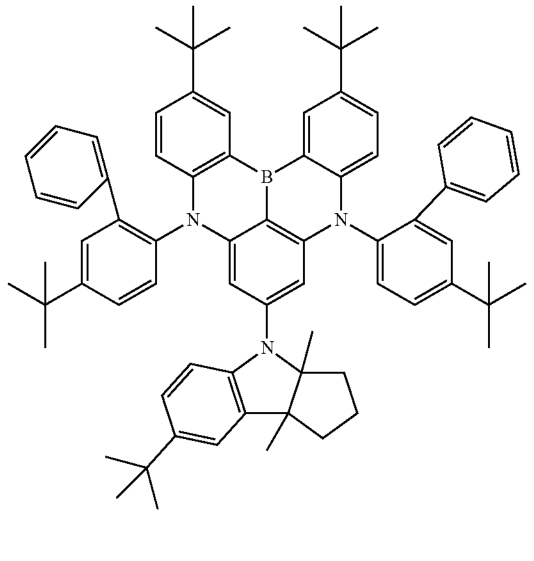

-continued
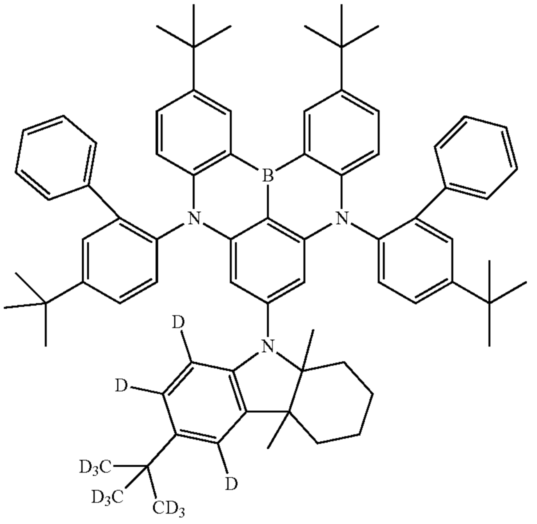
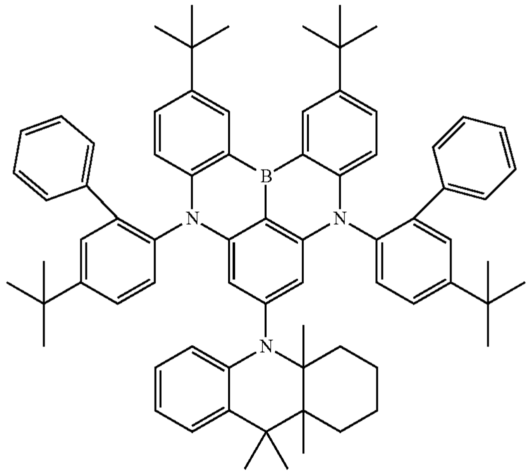
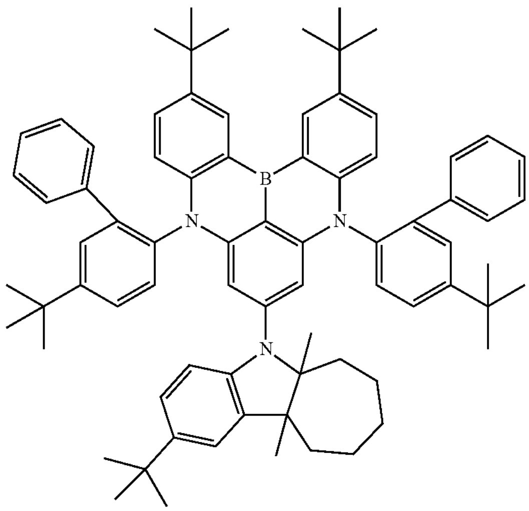
-continued
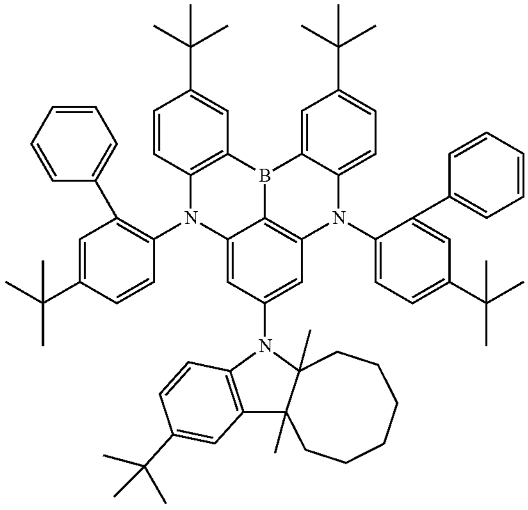
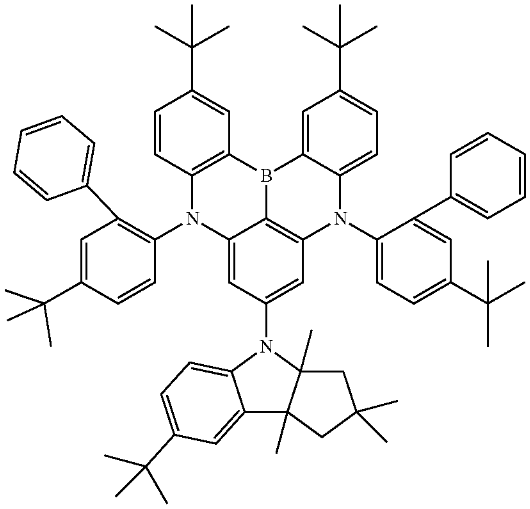
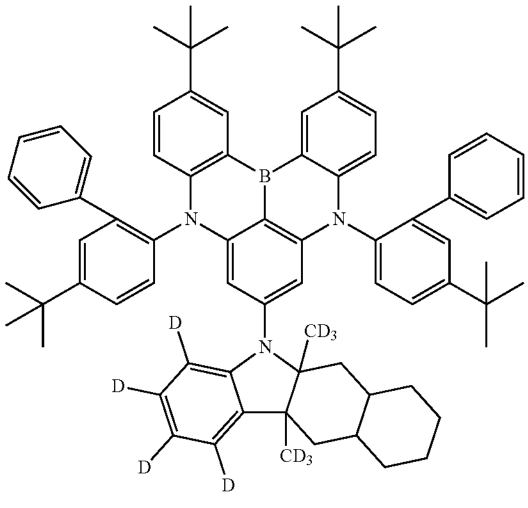

-continued
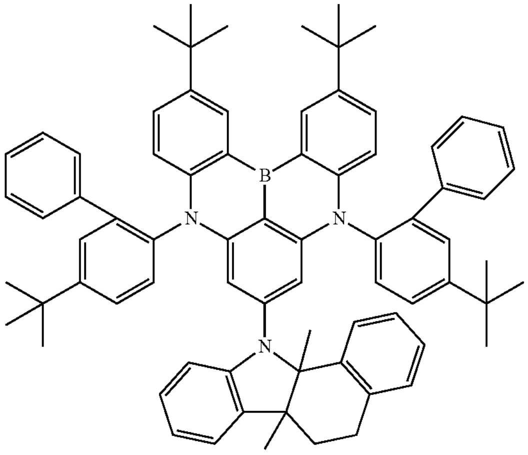
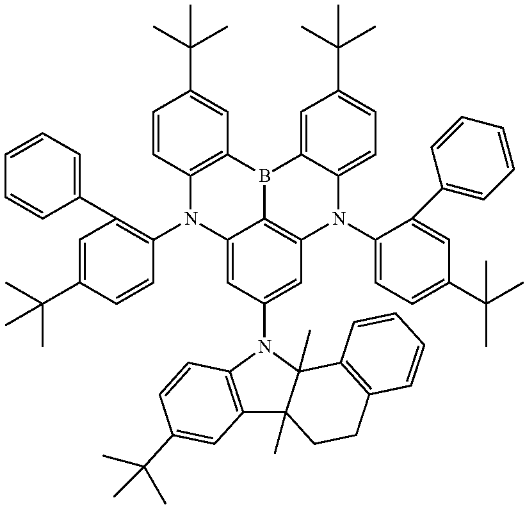
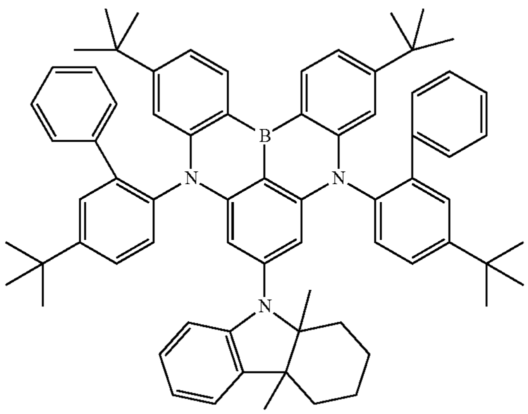
-continued
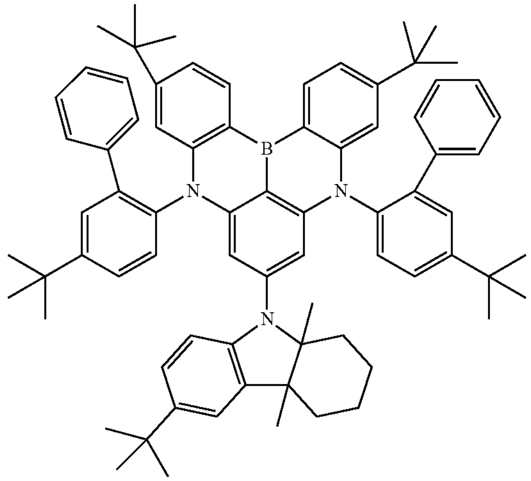
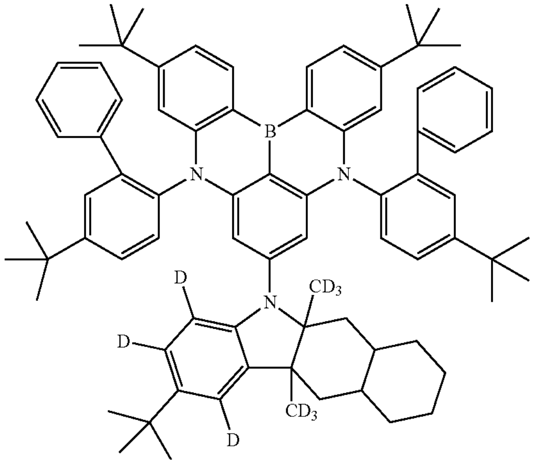
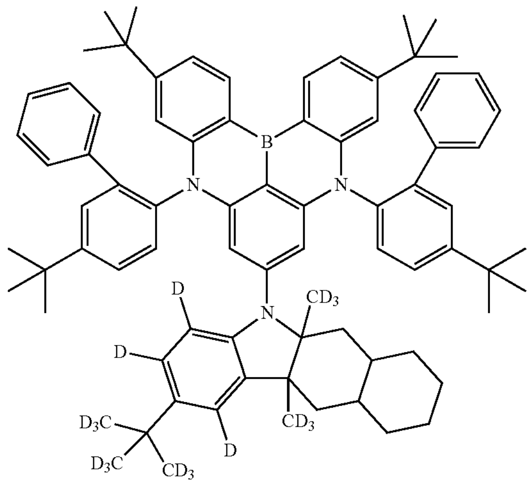

-continued
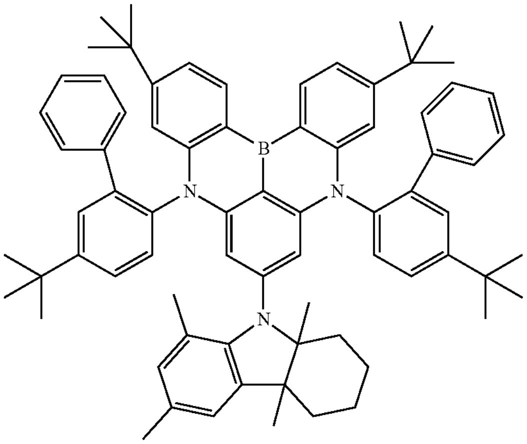
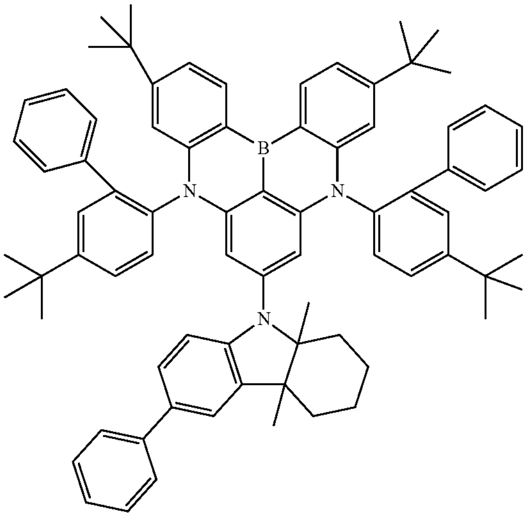
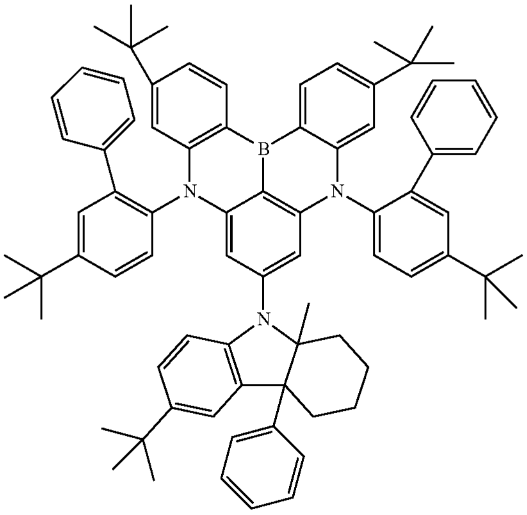
-continued
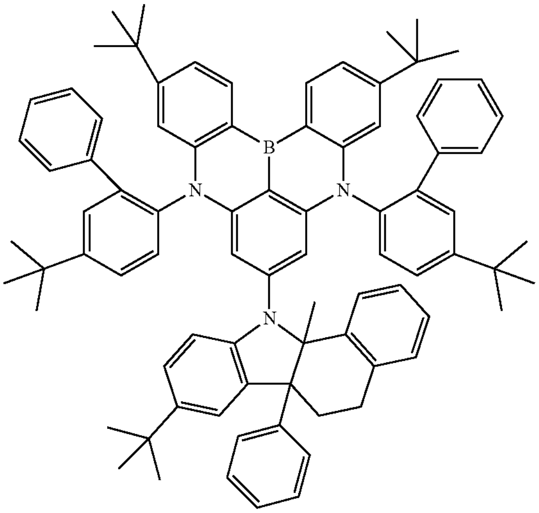
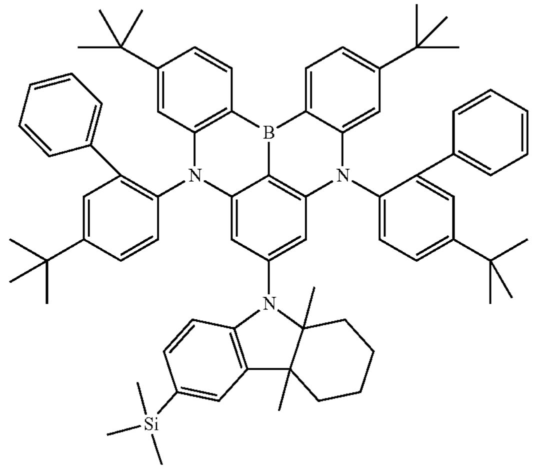
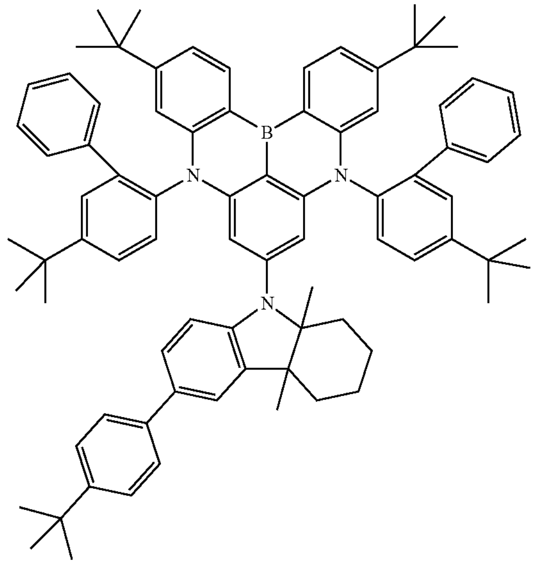

-continued
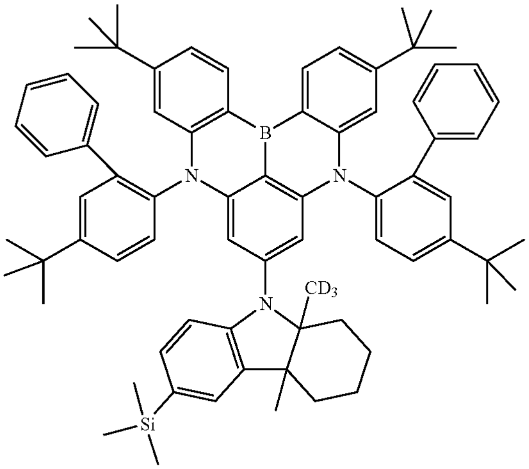
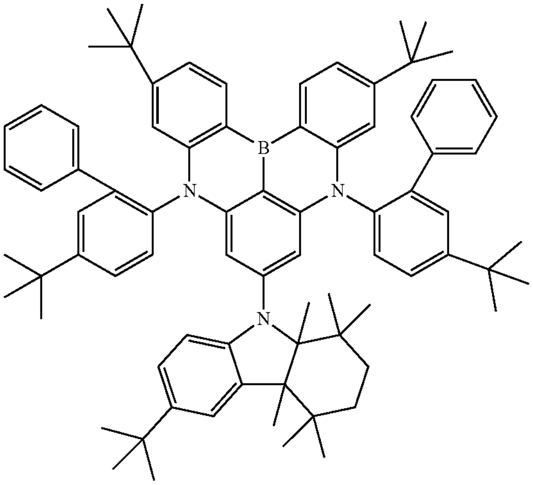
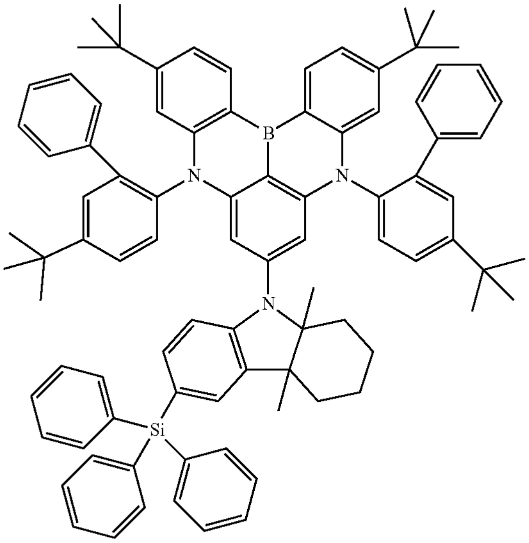
-continued
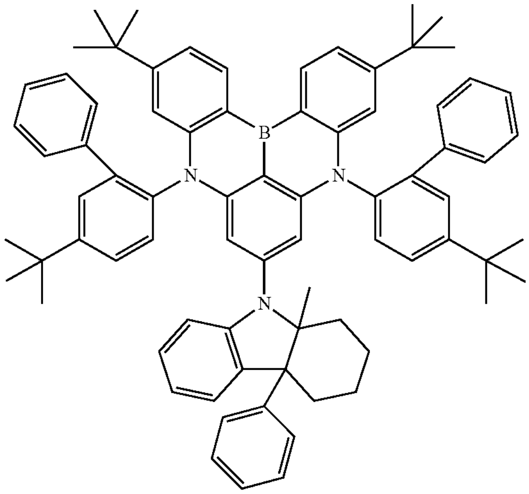
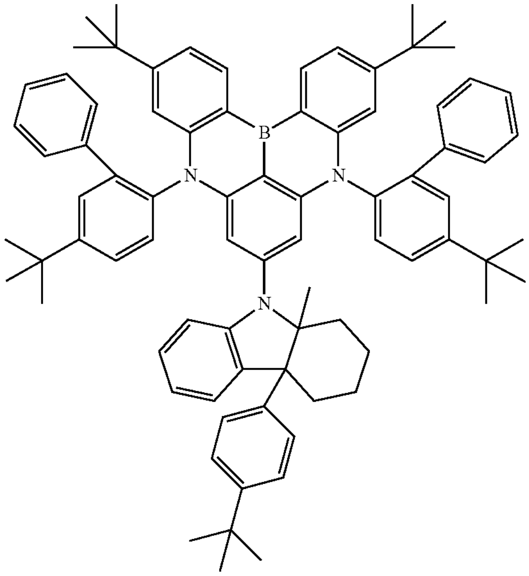
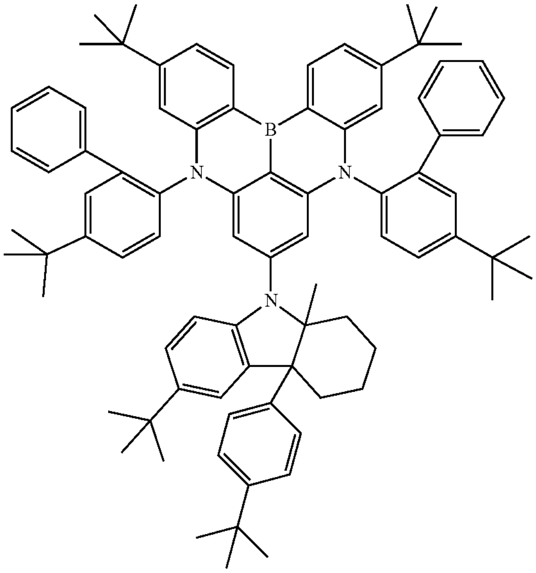

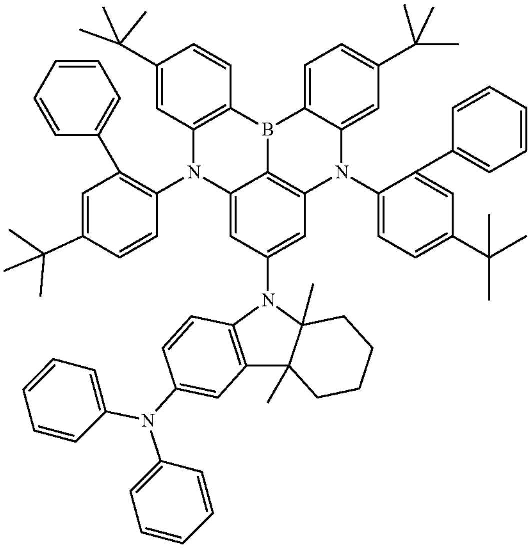
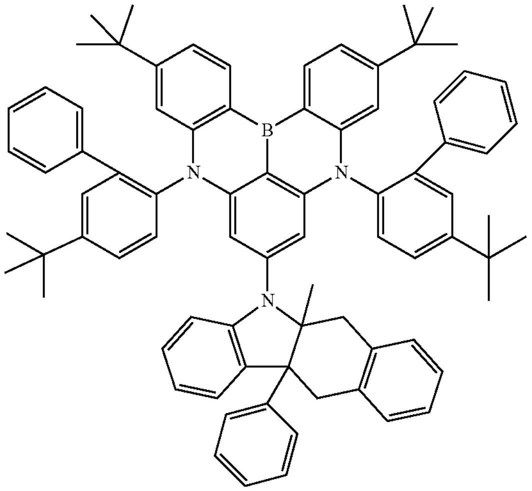
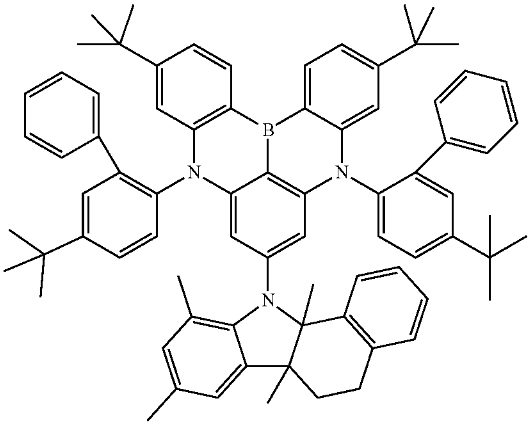
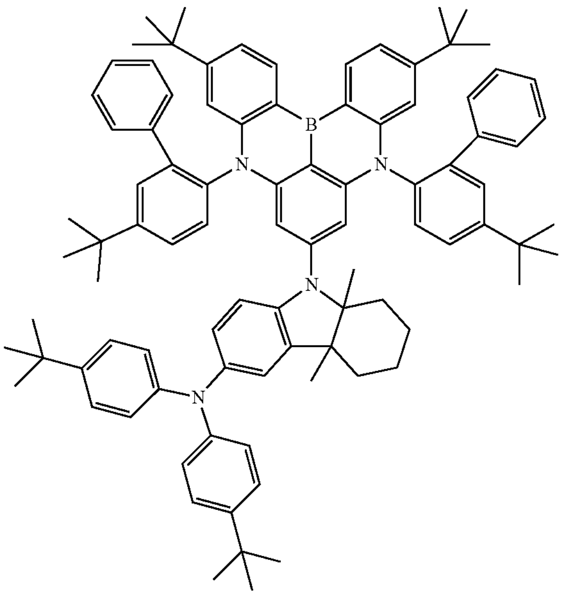
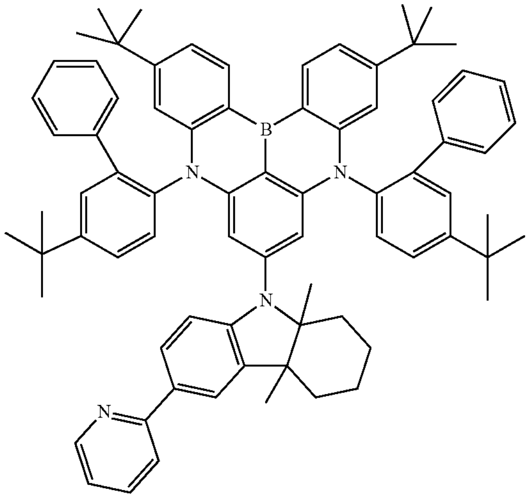
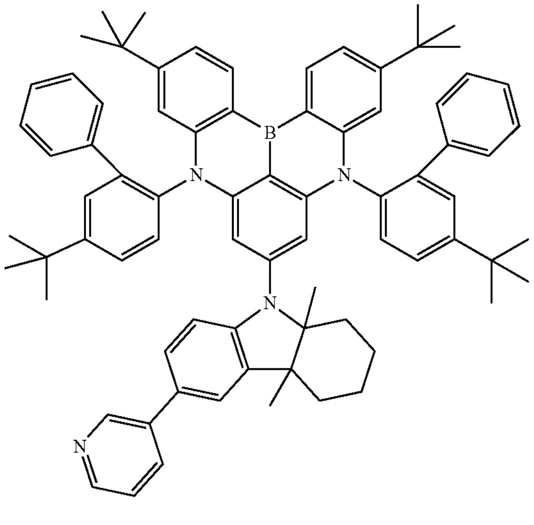

-continued
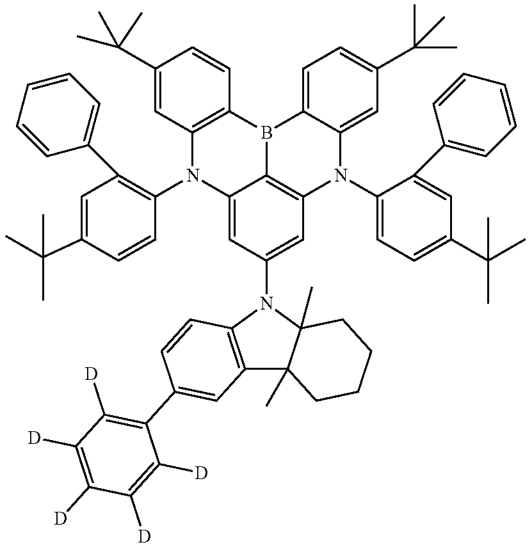
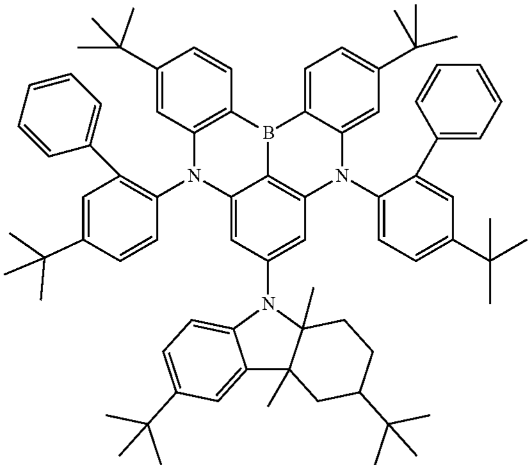
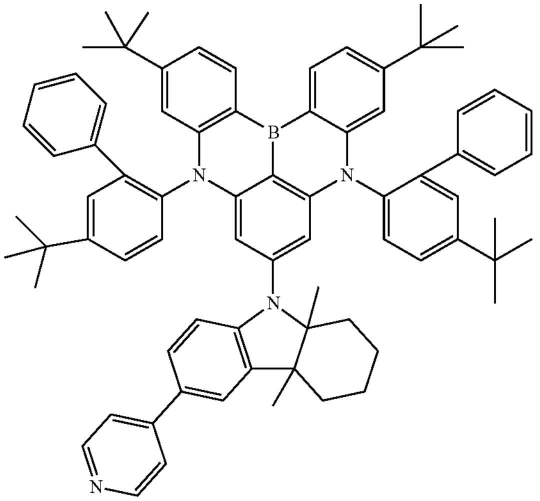
-continued
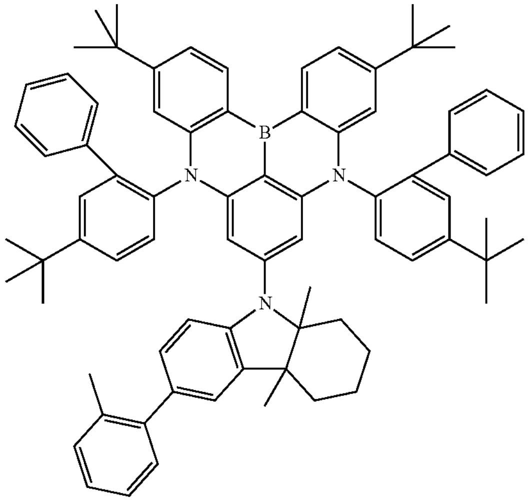
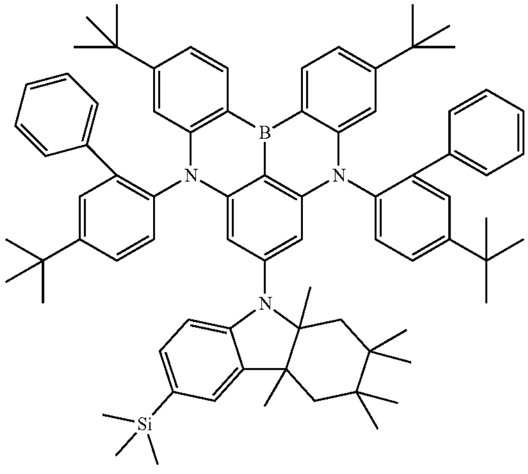
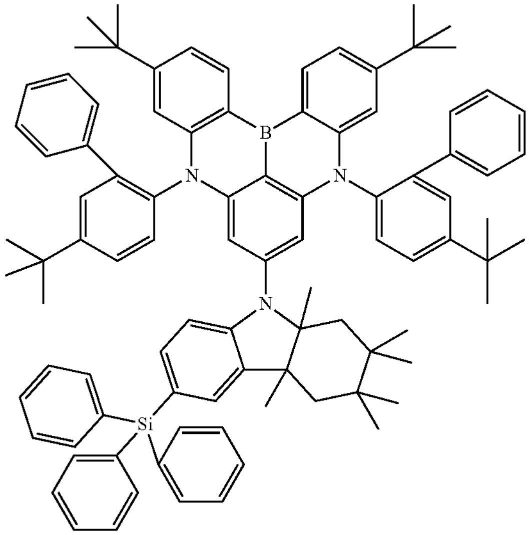

-continued
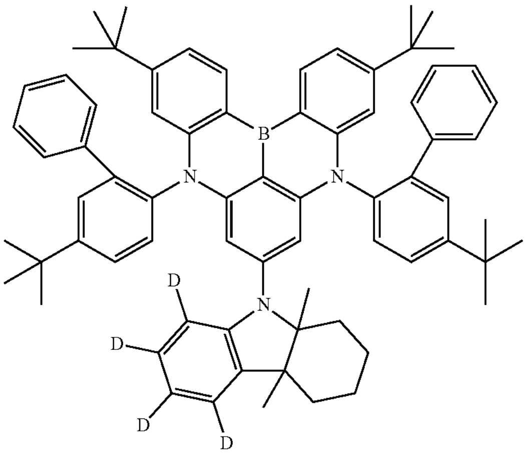
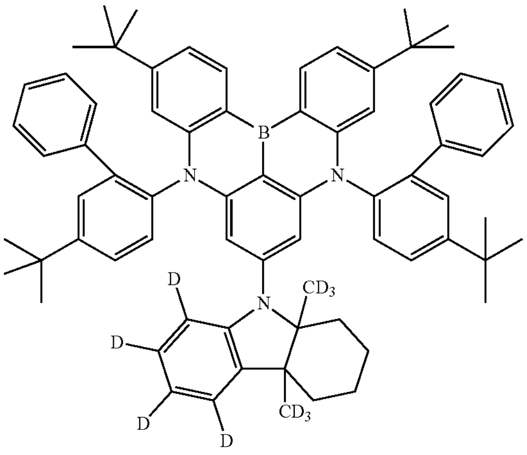
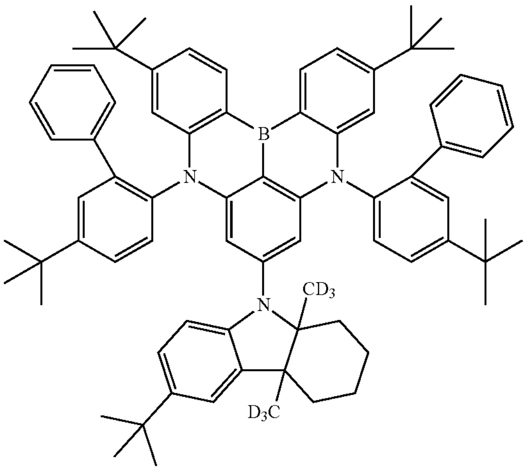
-continued
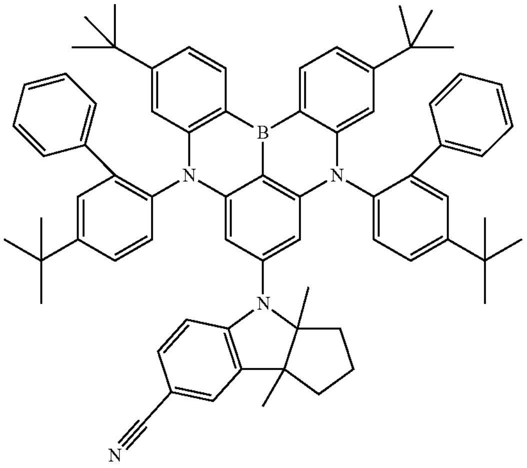
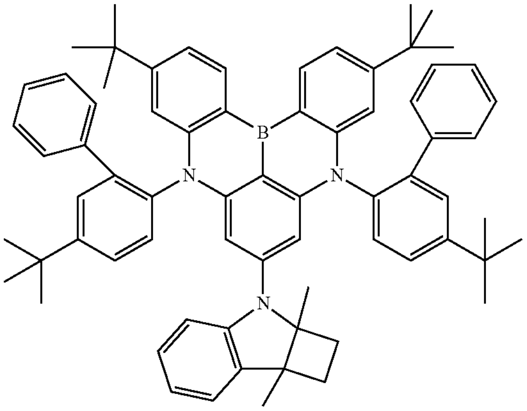
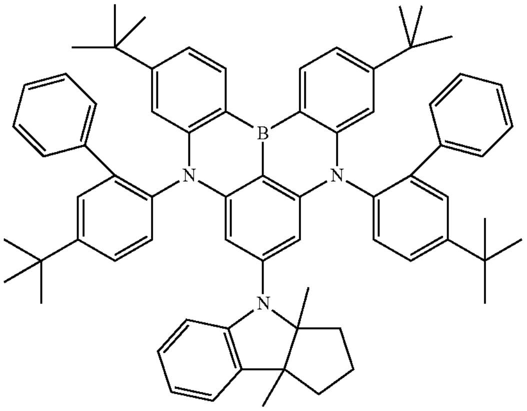
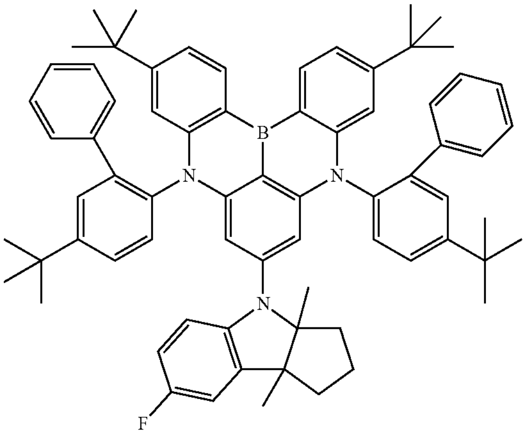

-continued
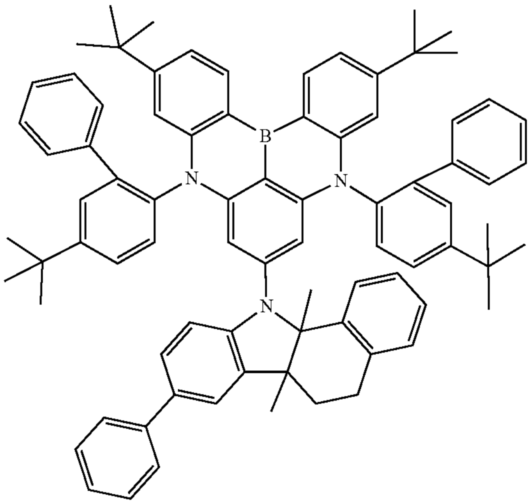
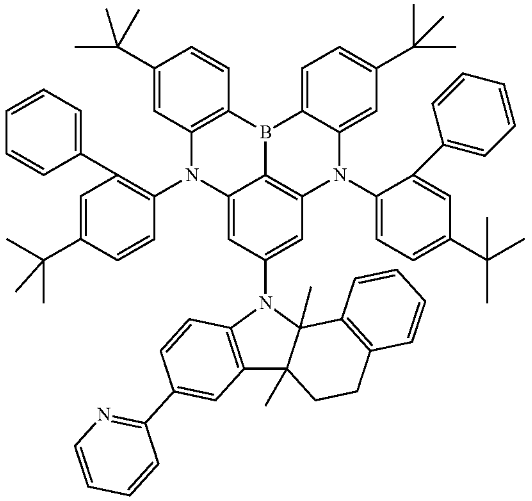
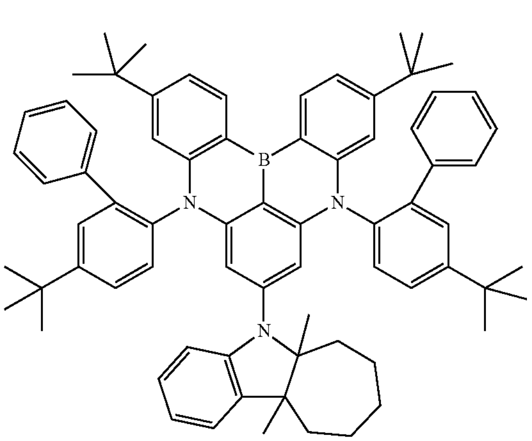
-continued
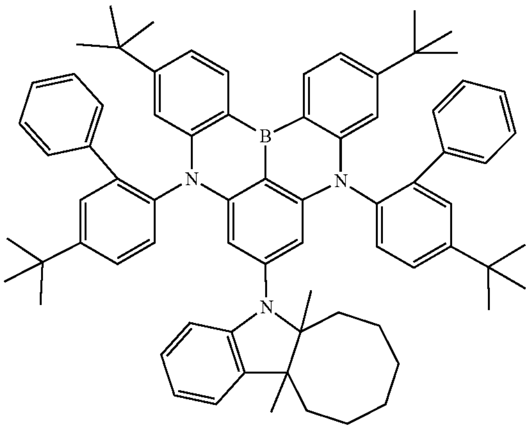
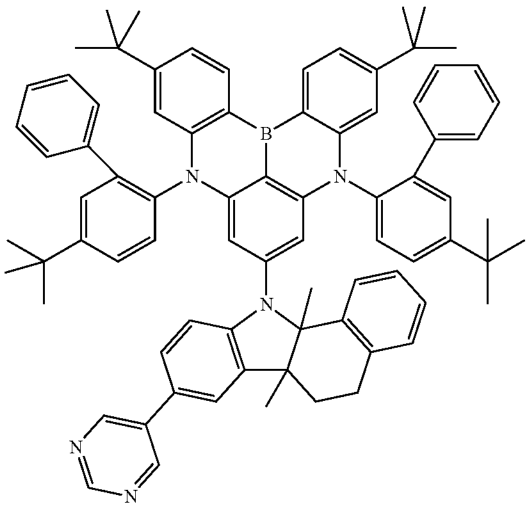
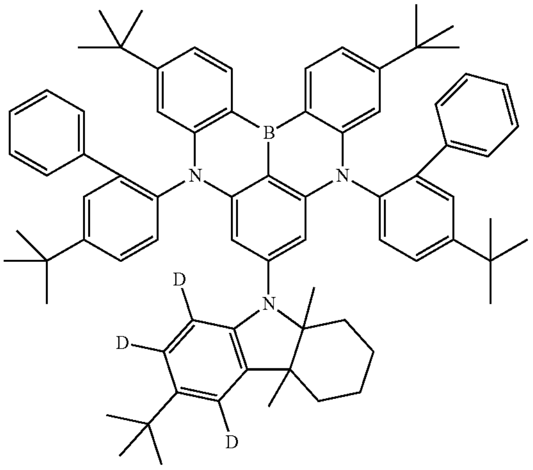

-continued
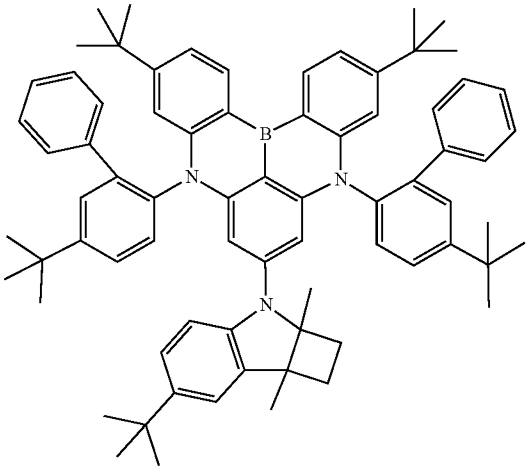
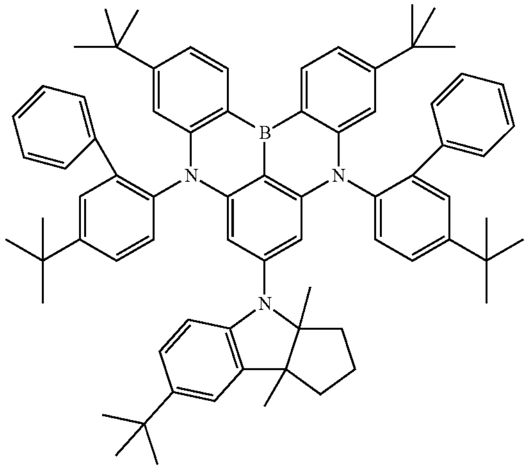
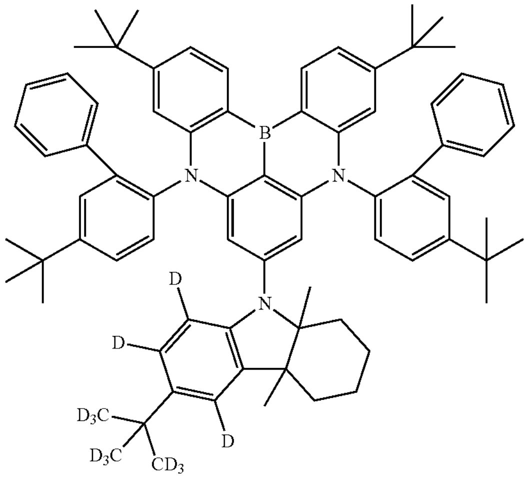
-continued
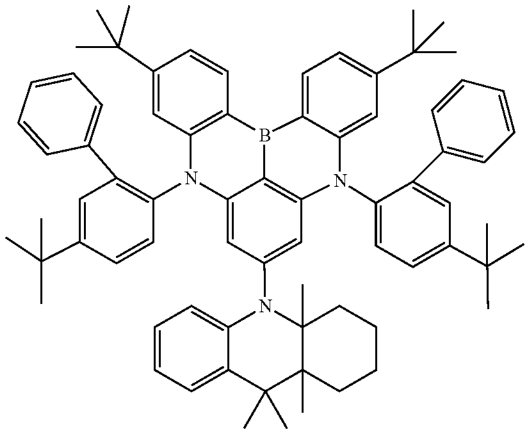
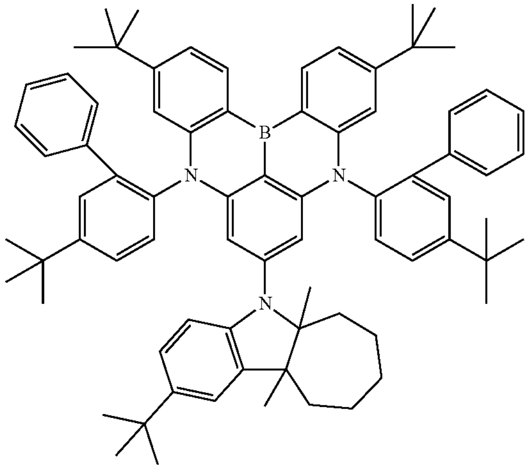
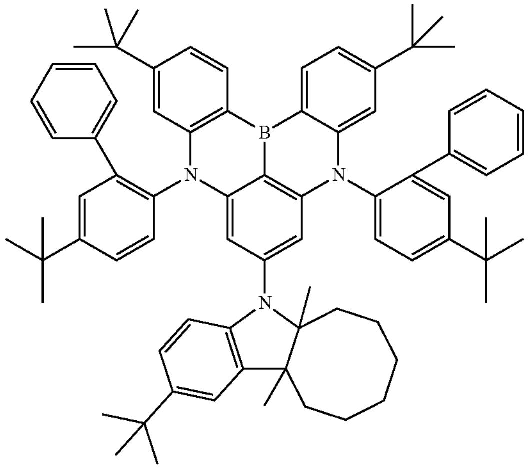

-continued
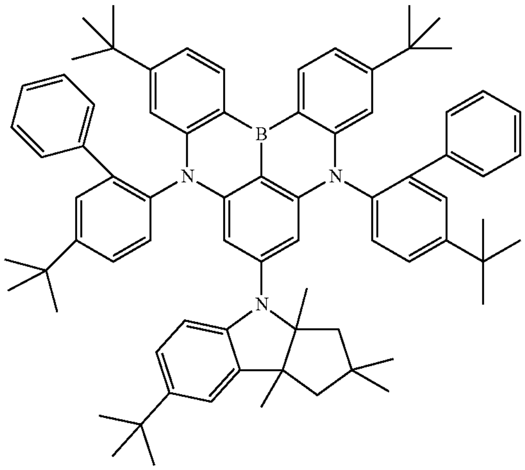
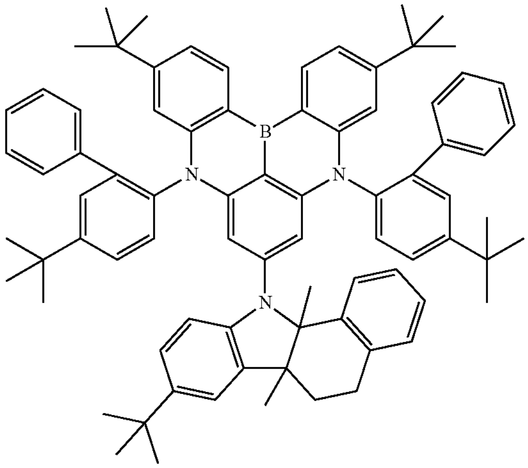
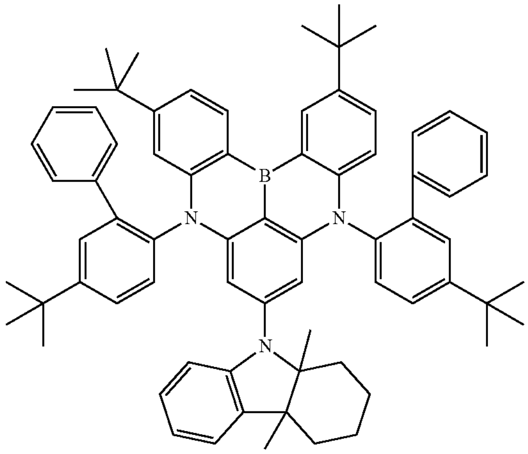
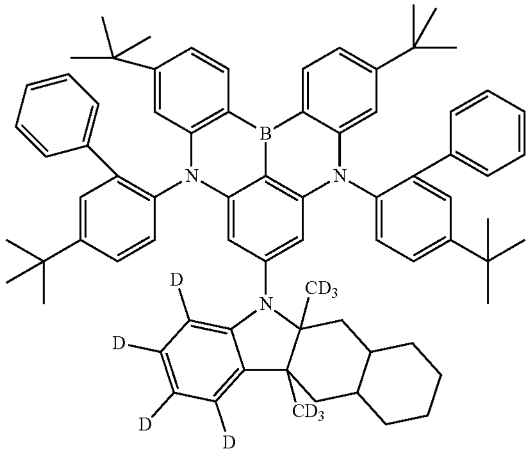
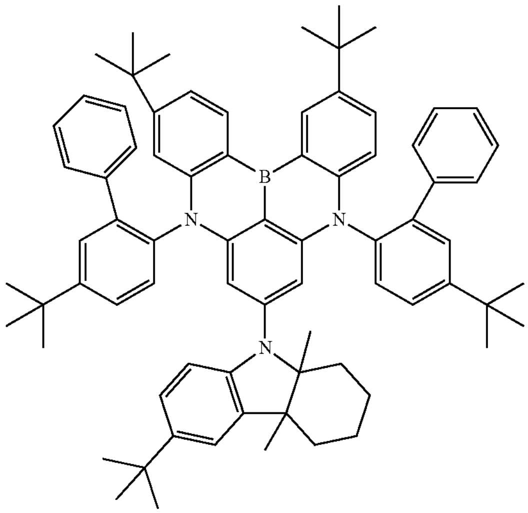
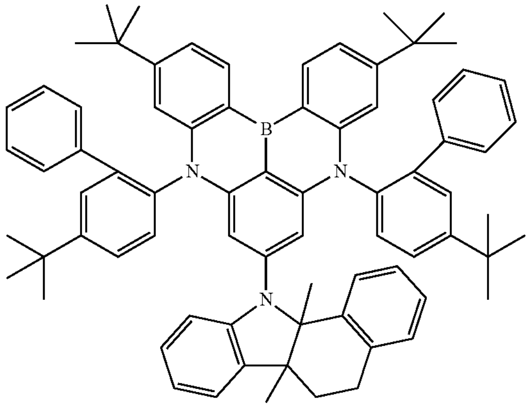
-continued

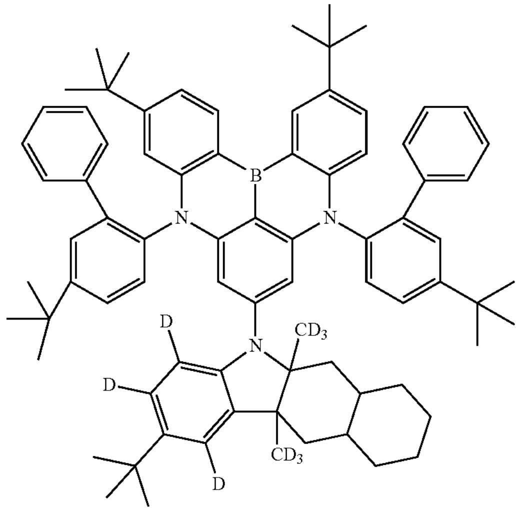
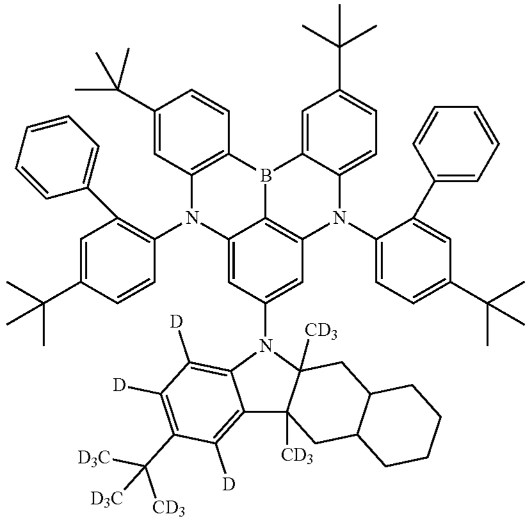
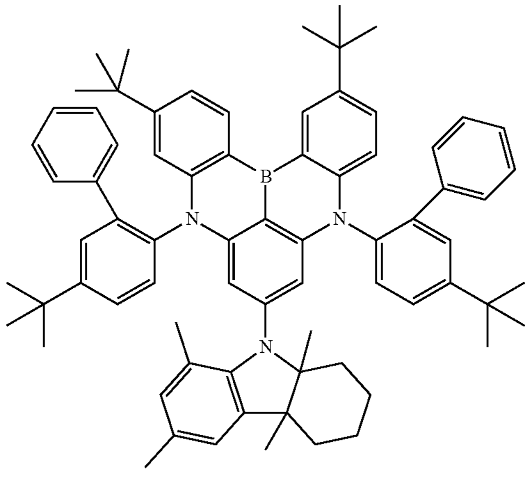
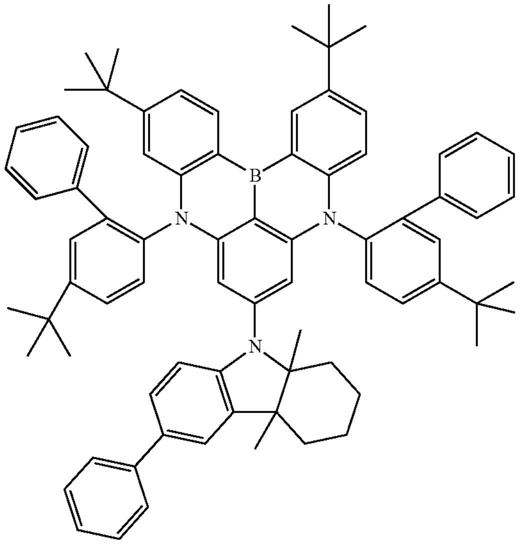
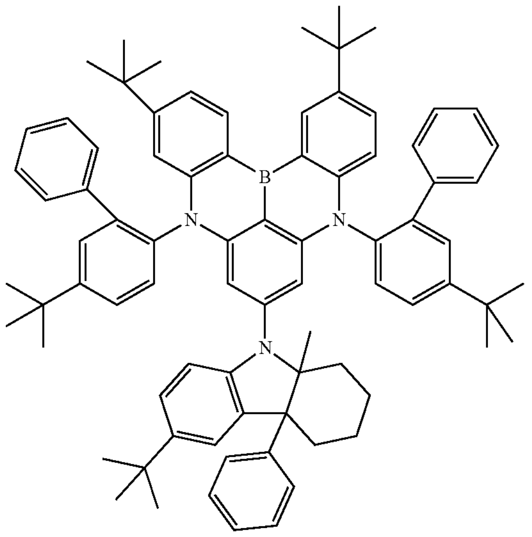
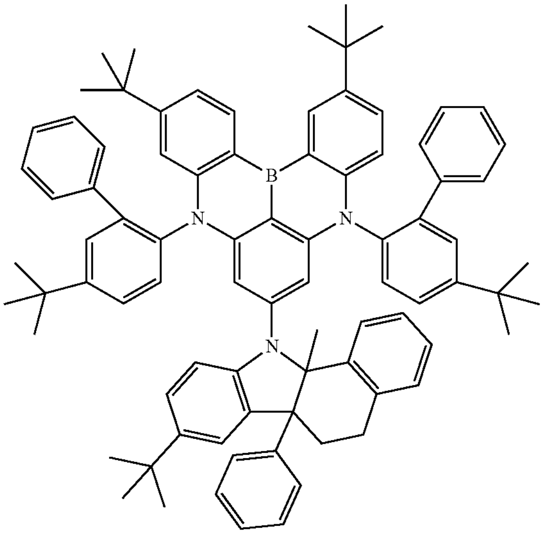

-continued
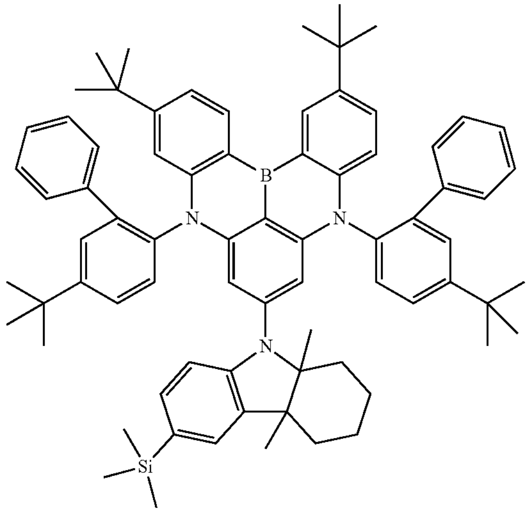
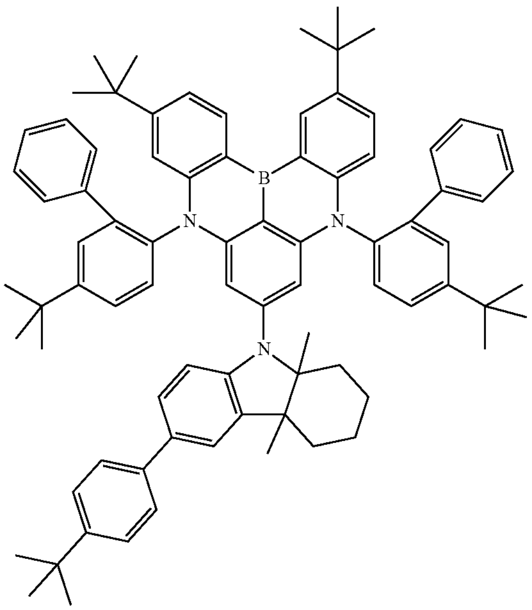
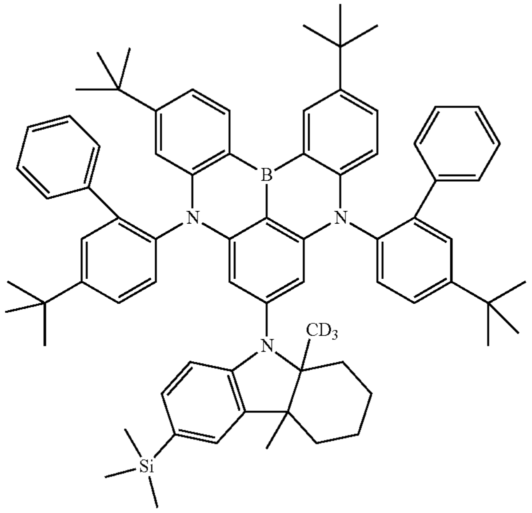
-continued
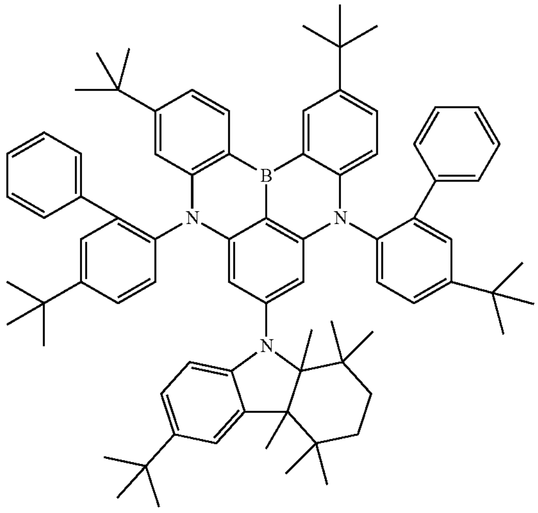
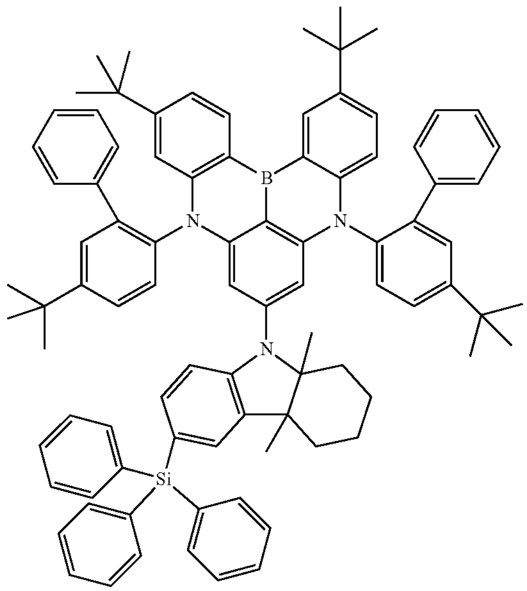
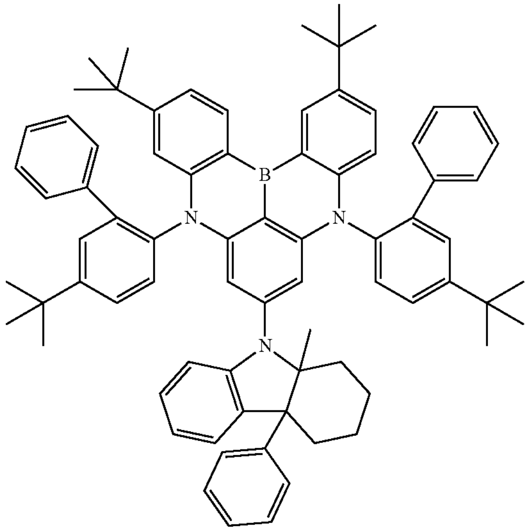

-continued
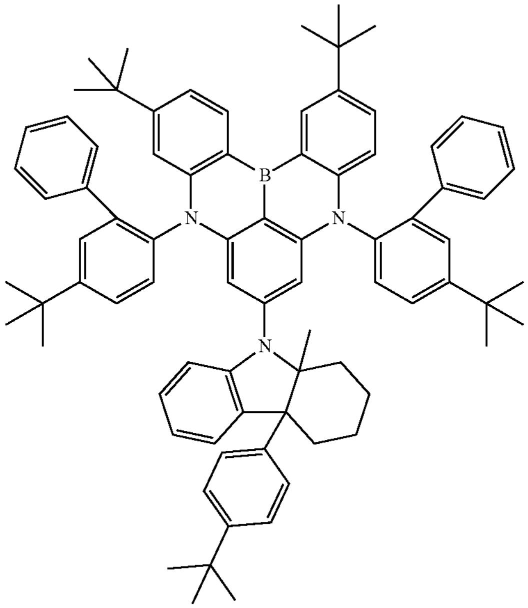
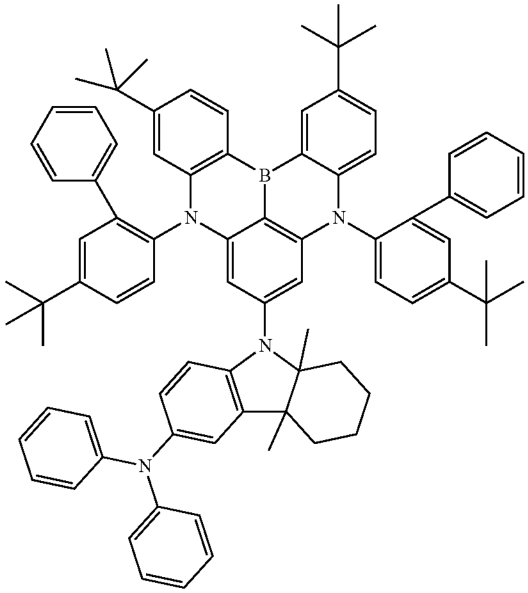
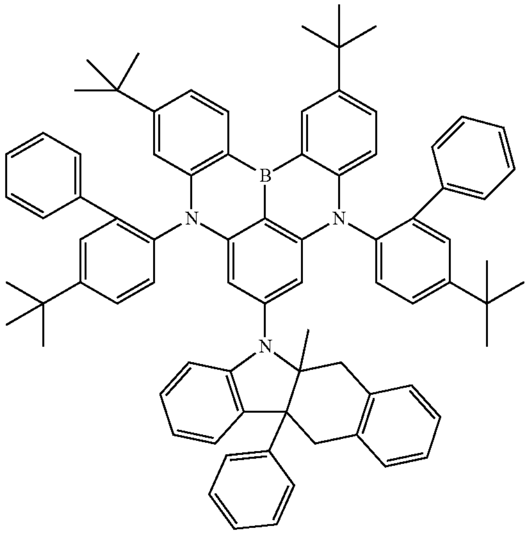
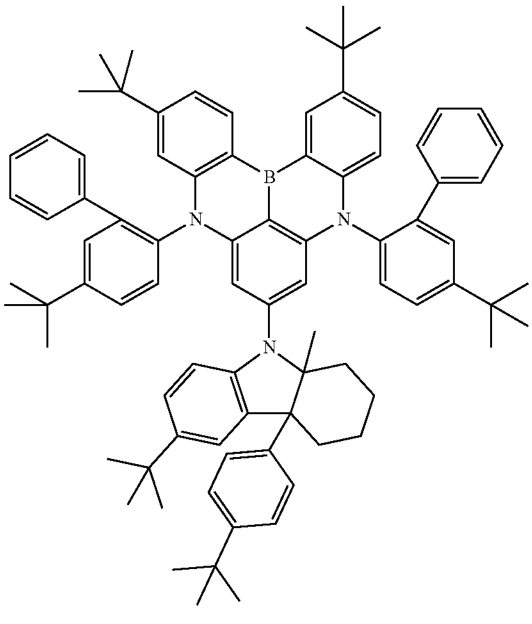 [SMILES: CC(C)(C)c1ccc(C23CCCCC2(C)N(c2cc4c5c(c2)N(c2ccc(C(C)(C)C)cc2-c2ccccc2)c2cc(C(C)(C)C)ccc2B5c2cc(C(C)(C)C)ccc2N4c2ccc(C(C)(C)C)cc2-c2ccccc2)c2ccc(C(C)(C)C)cc23)cc1]
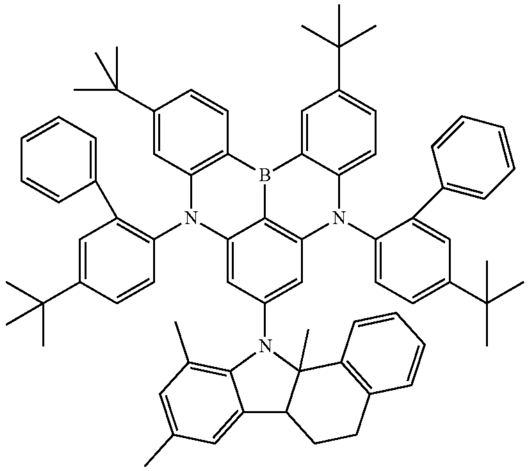

-continued
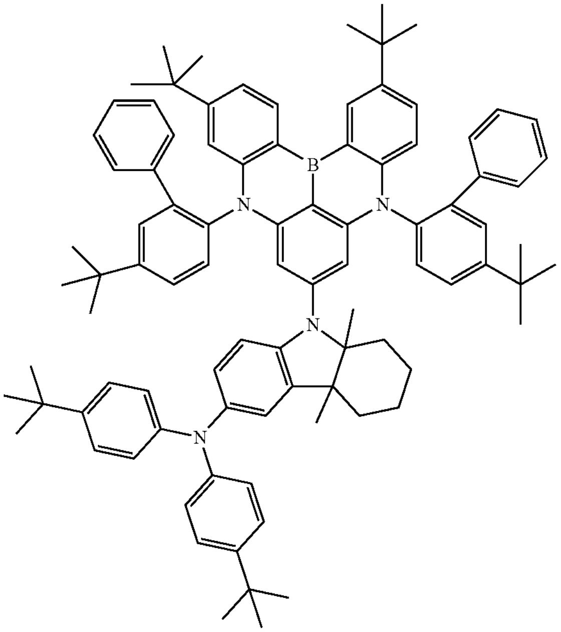
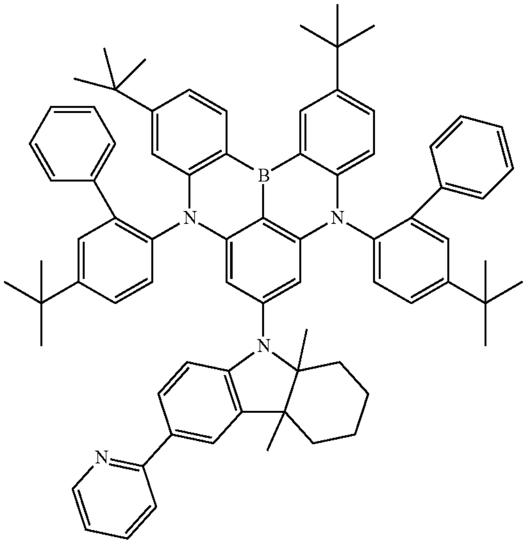
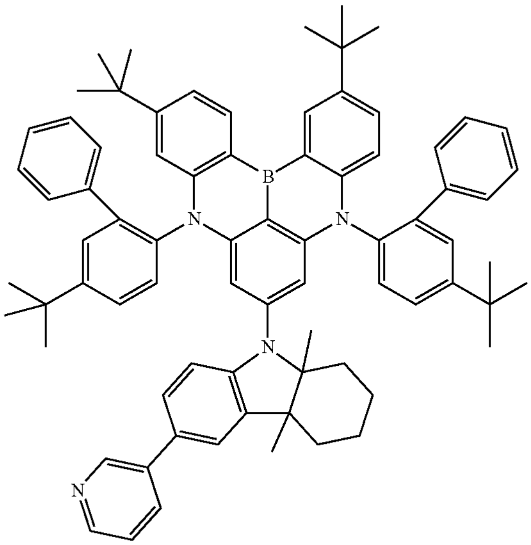
-continued
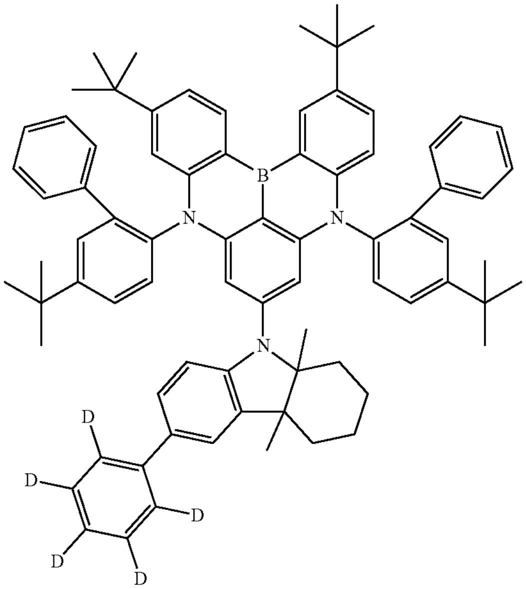
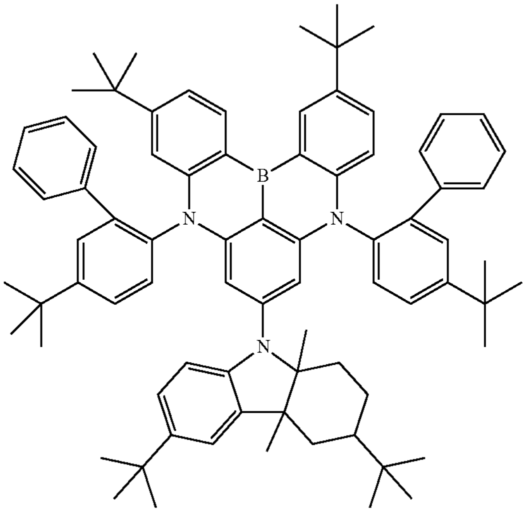
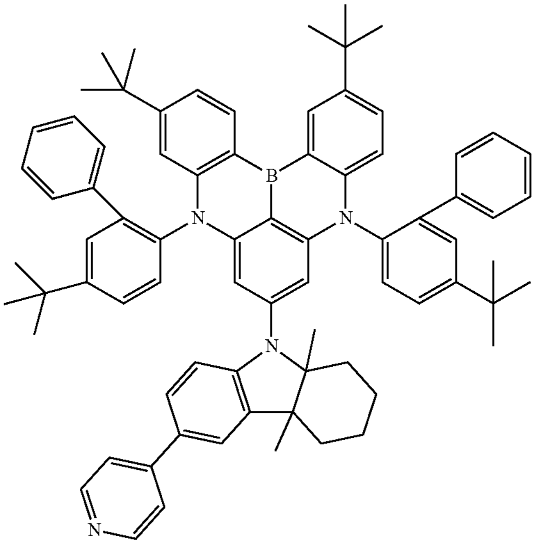

-continued
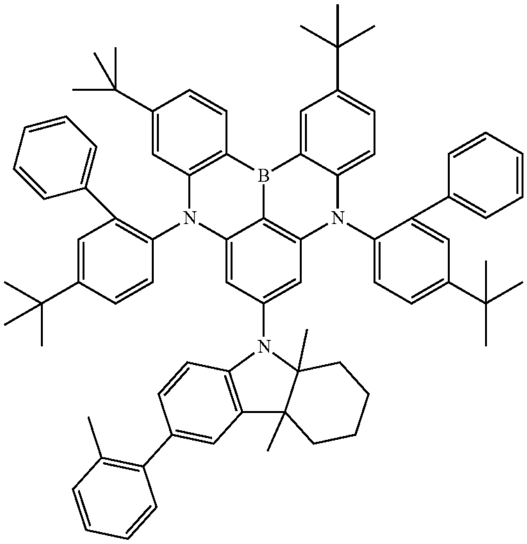
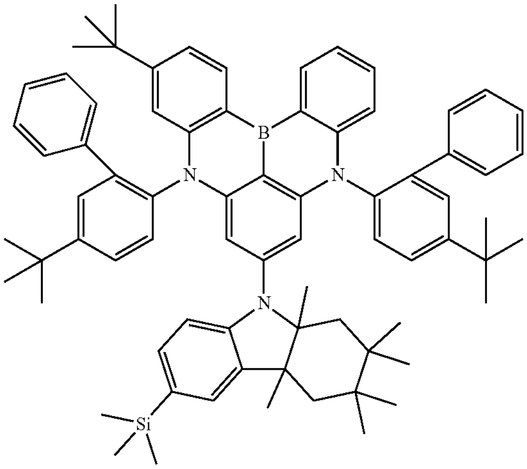
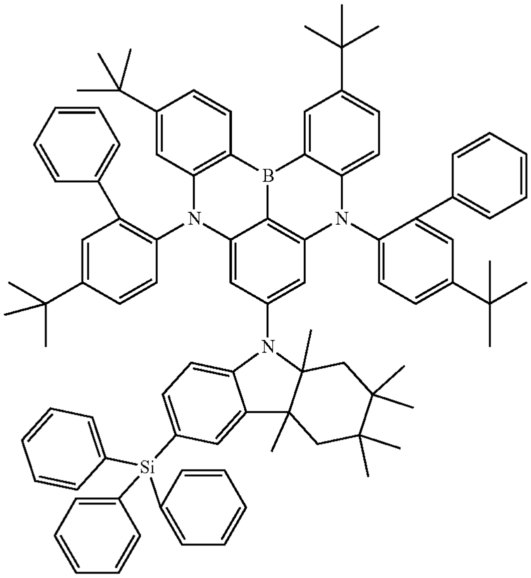
-continued
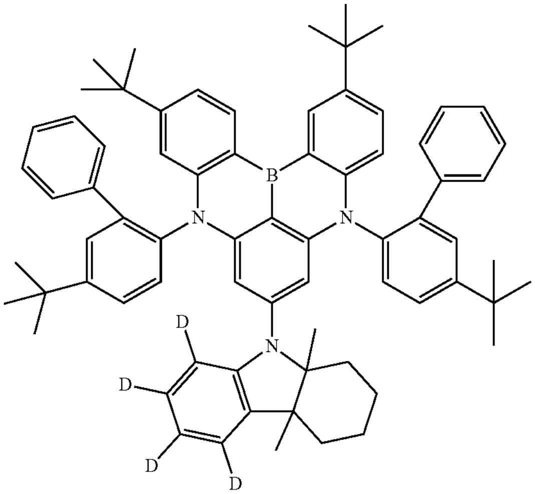
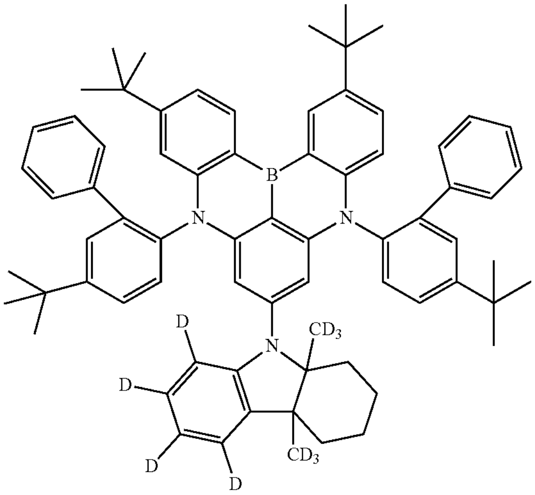
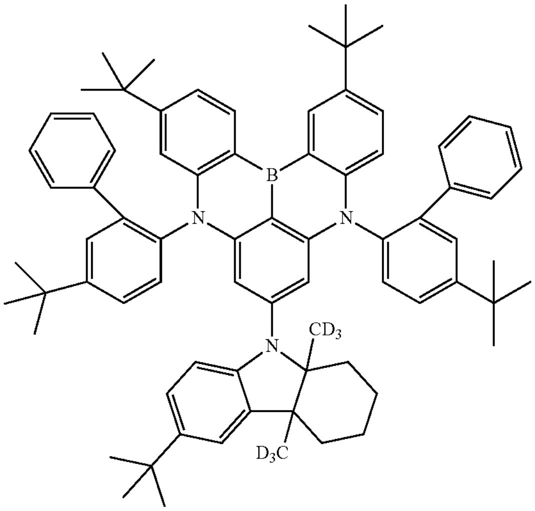

-continued
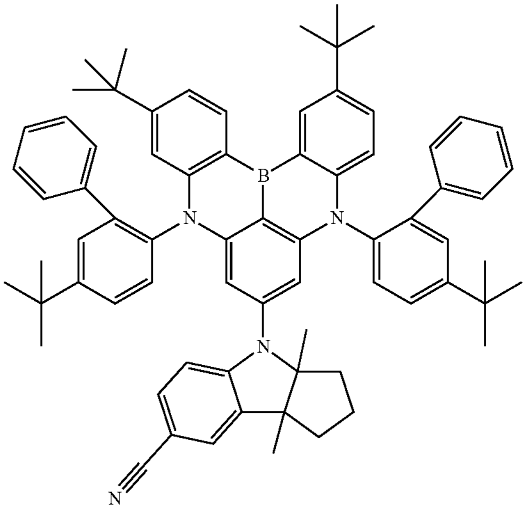
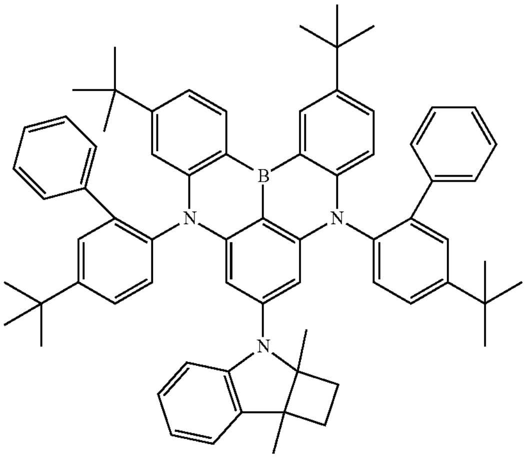
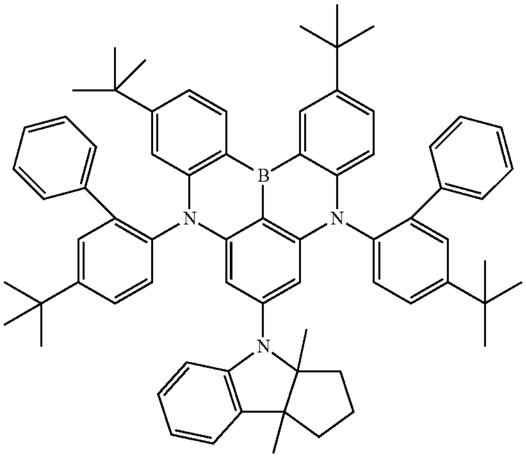
-continued
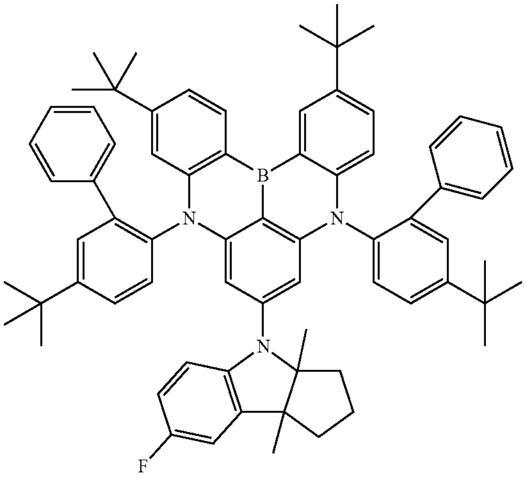
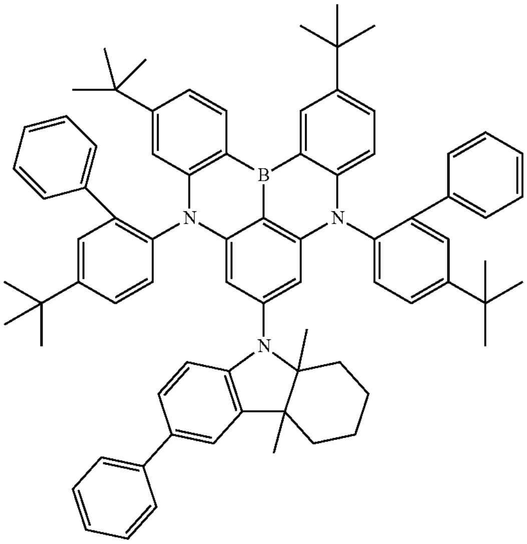
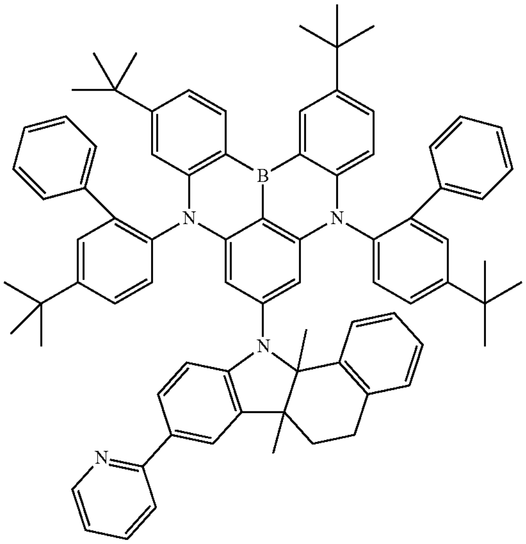

-continued
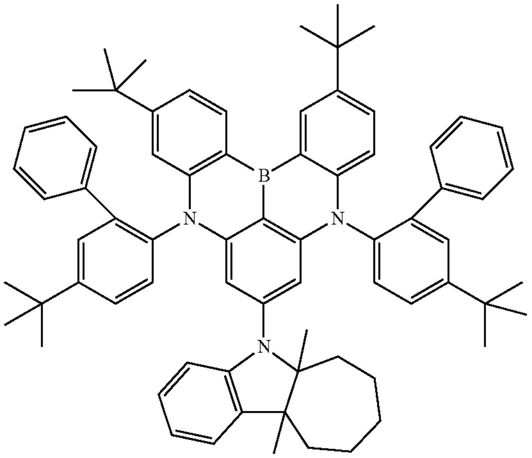
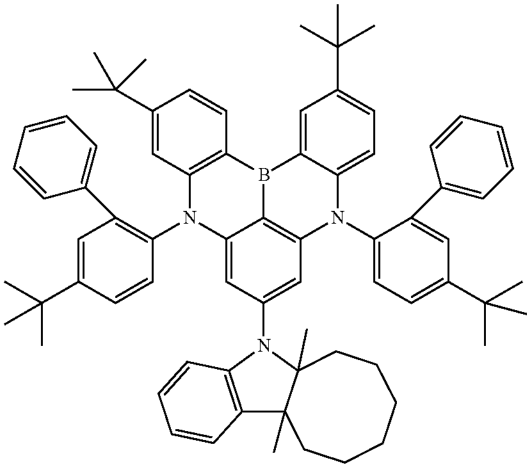
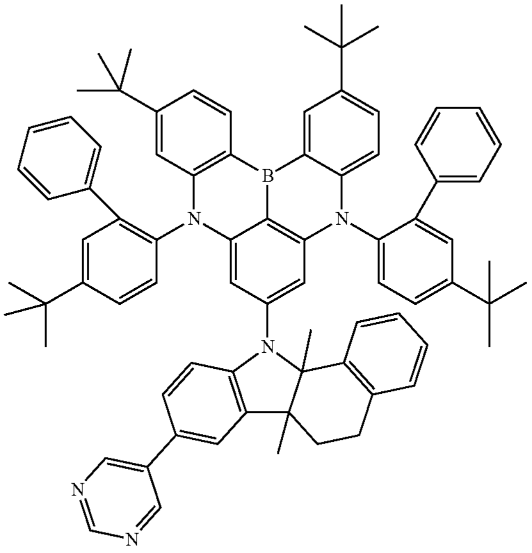
-continued
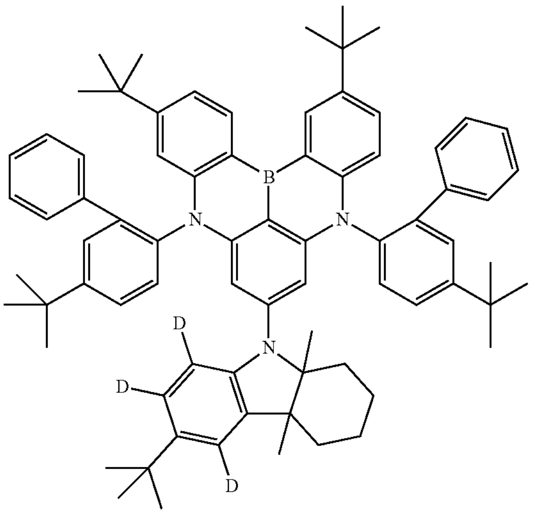
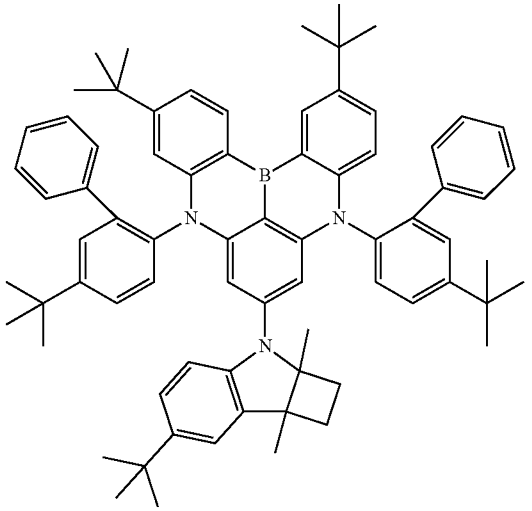
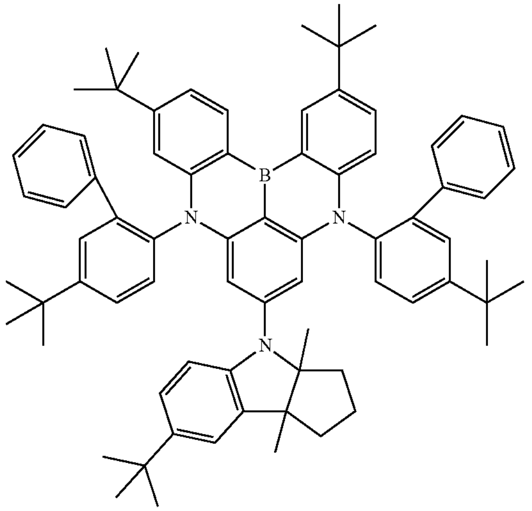

-continued
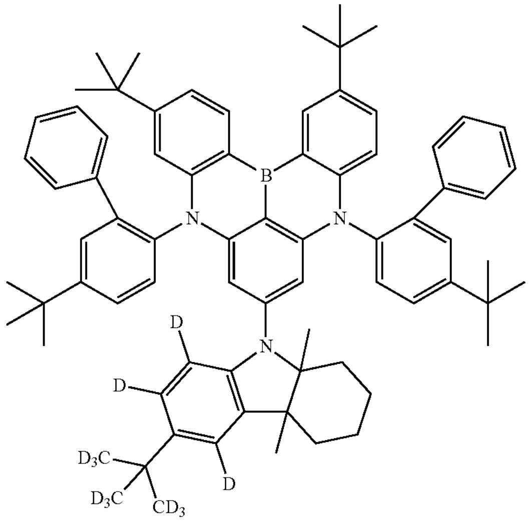
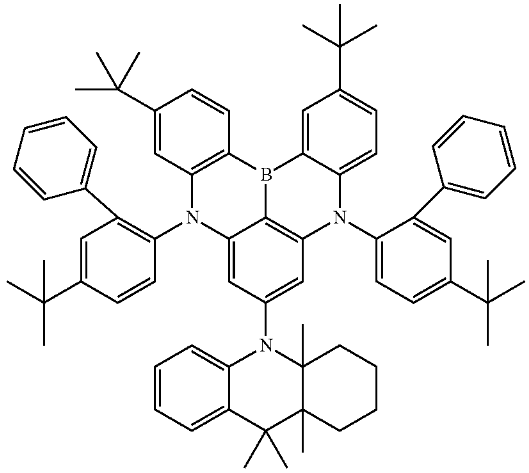
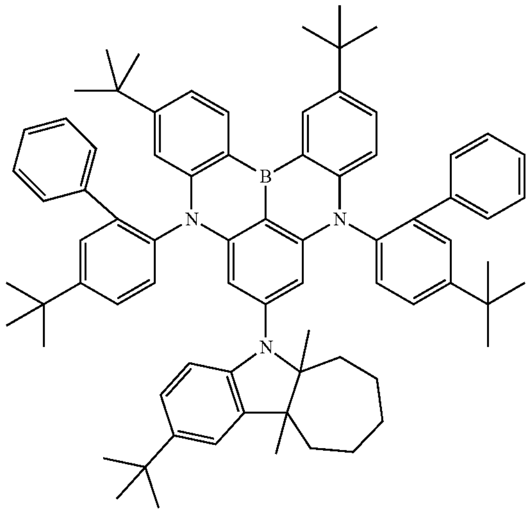
-continued
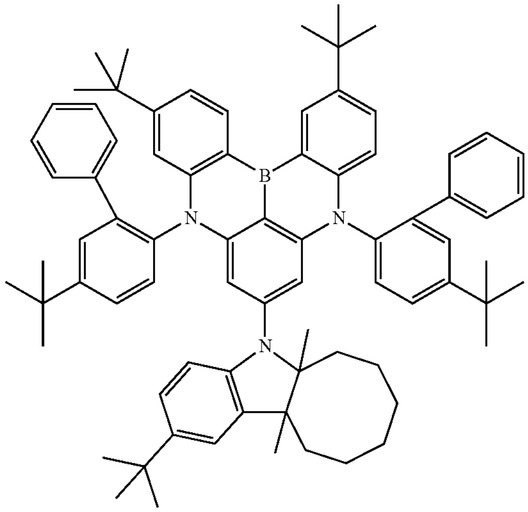
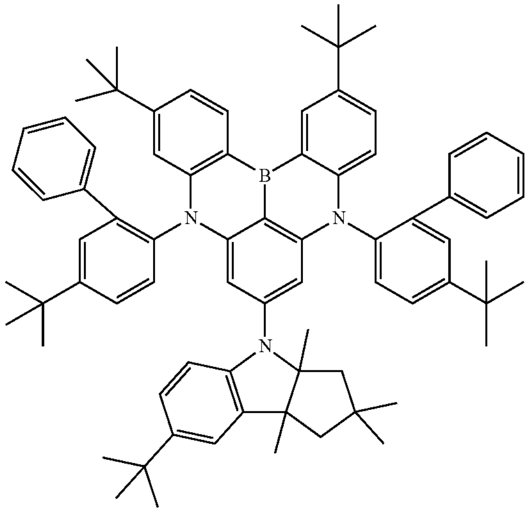
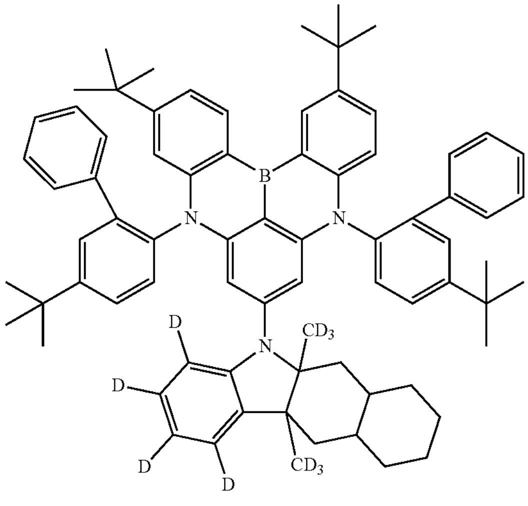

-continued
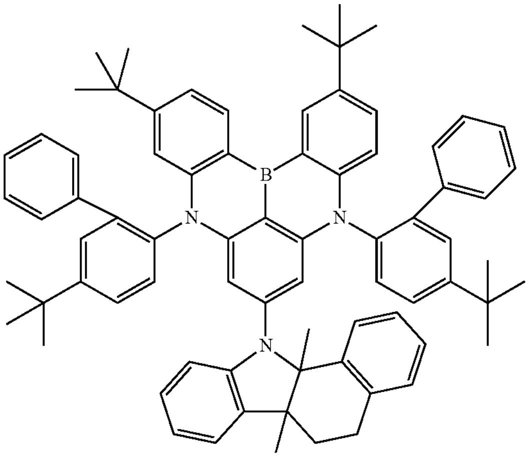
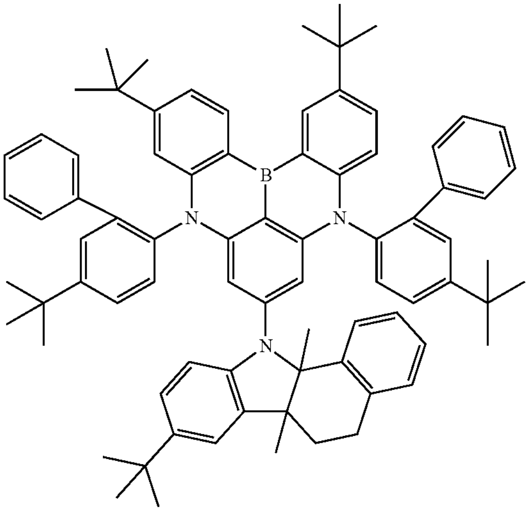 [SMILES: CC(C)(C)c1ccc2c(c1)B1c3ccc(C(C)(C)C)cc3N(c3ccc(C(C)(C)C)cc3-c3ccccc3)c3cc(N4c5ccc(C(C)(C)C)cc5C5(C)CCc6ccccc6C45C)cc(c31)N2c1ccc(C(C)(C)C)cc1-c1ccccc1]
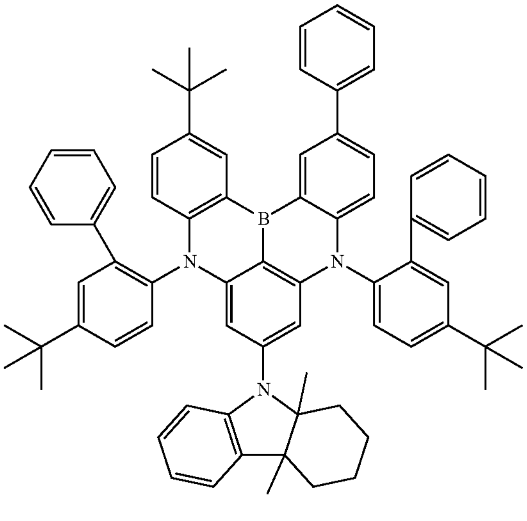
-continued
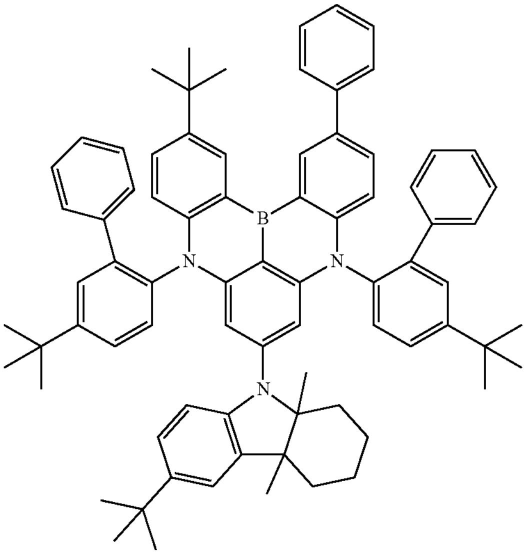
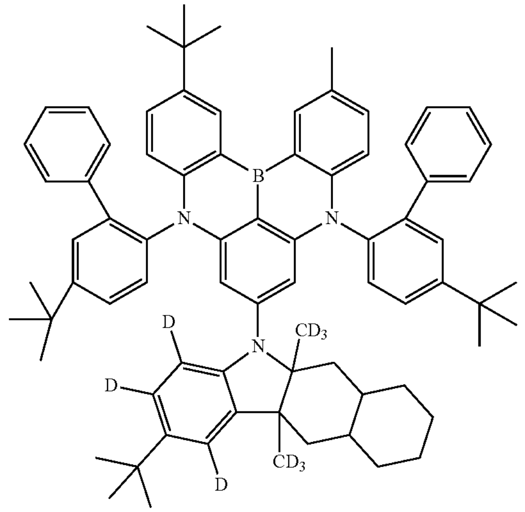
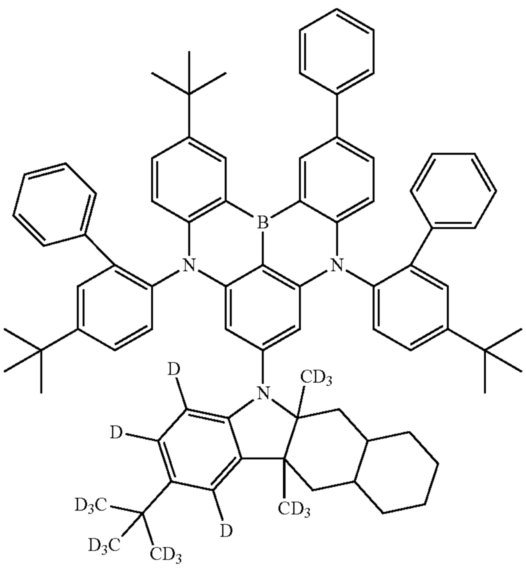

-continued
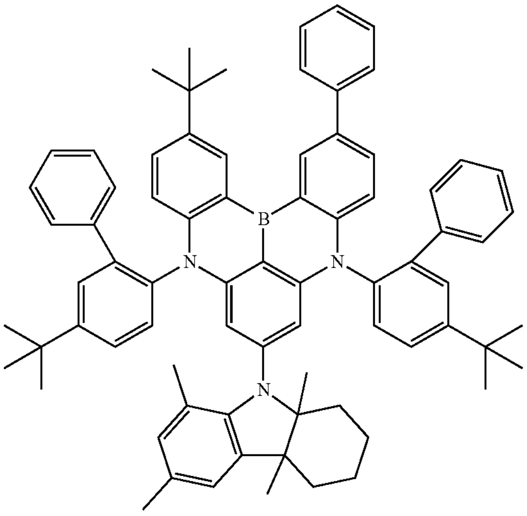
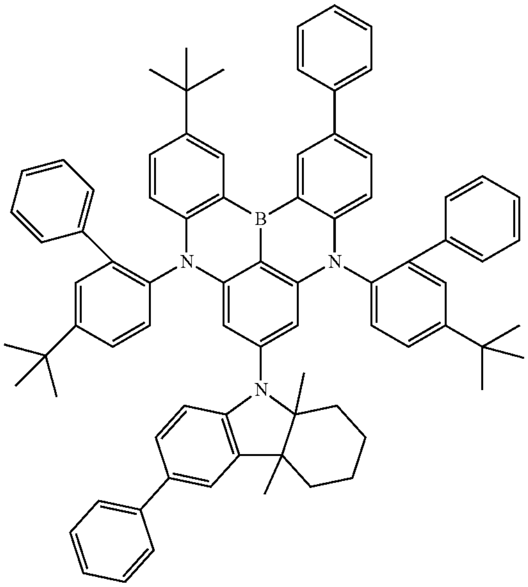
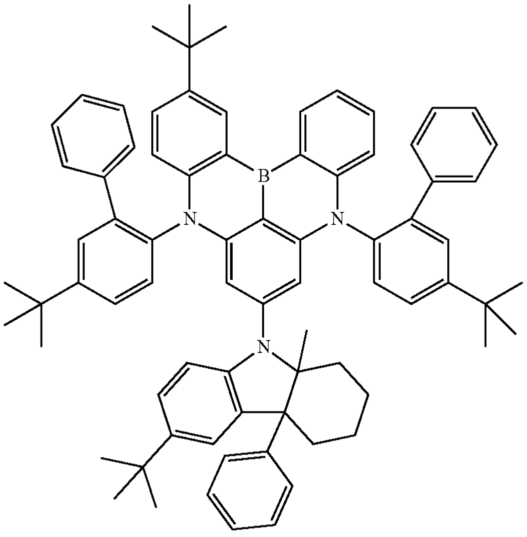
-continued
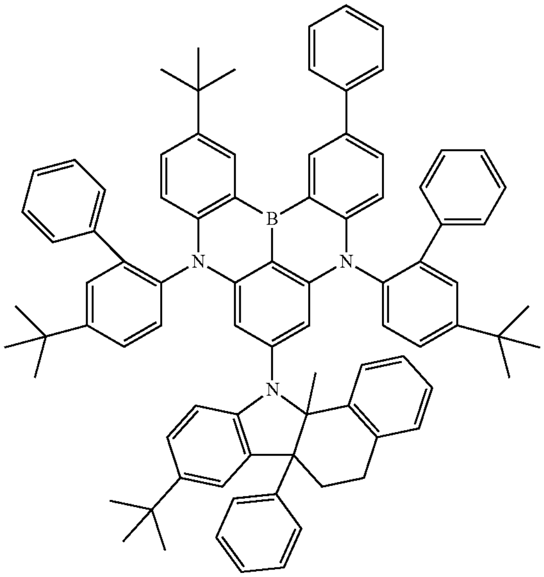
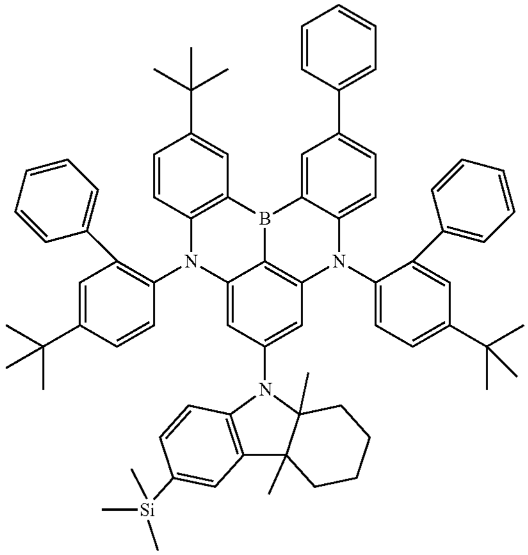

-continued
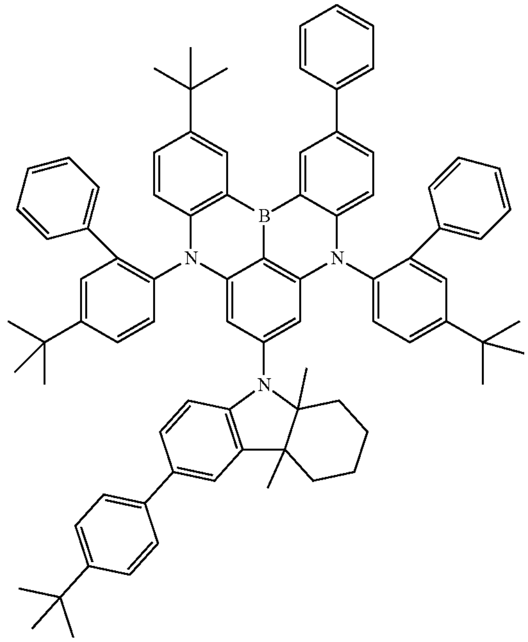
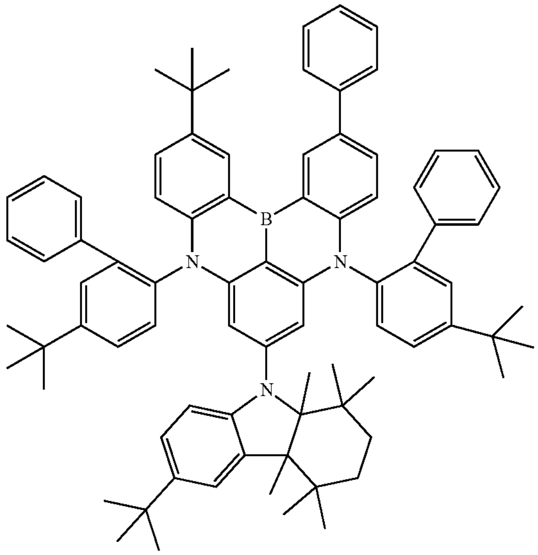
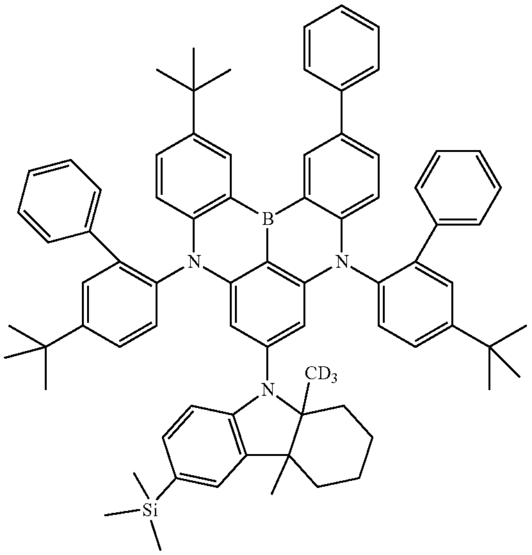
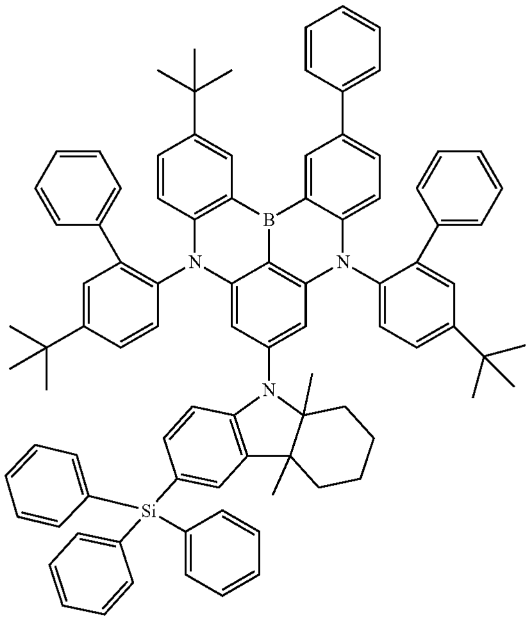

-continued
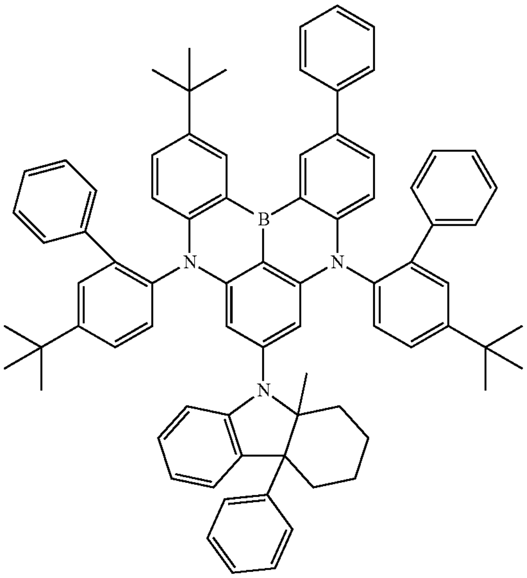
-continued
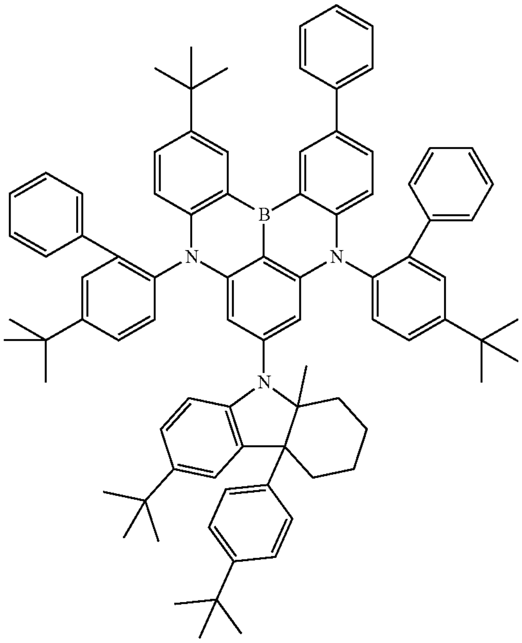
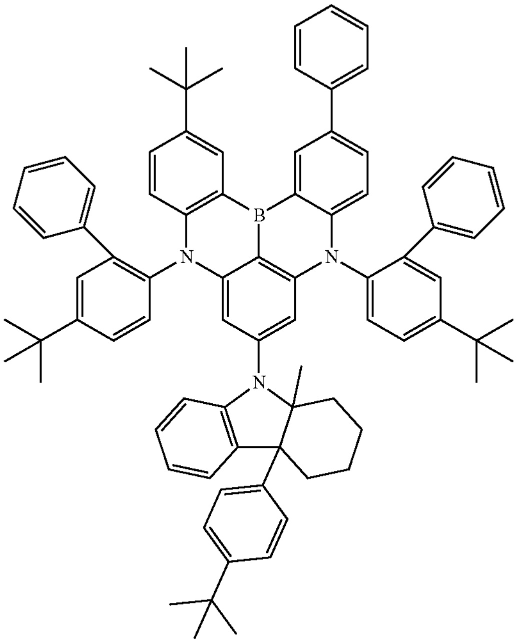
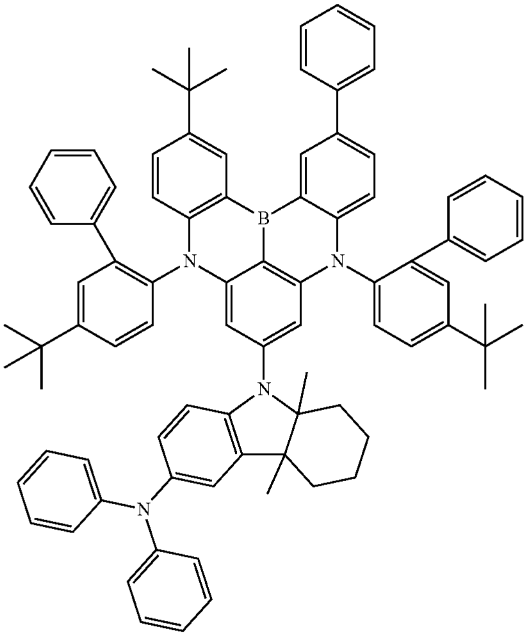

-continued
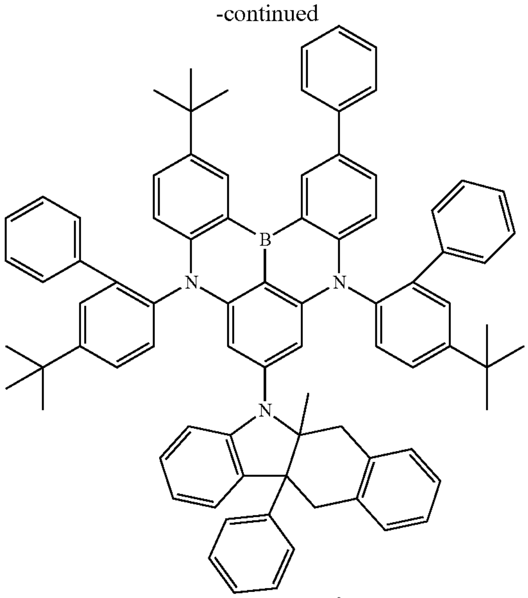
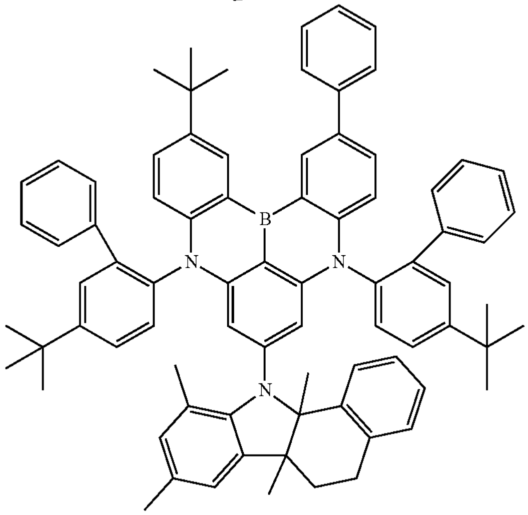
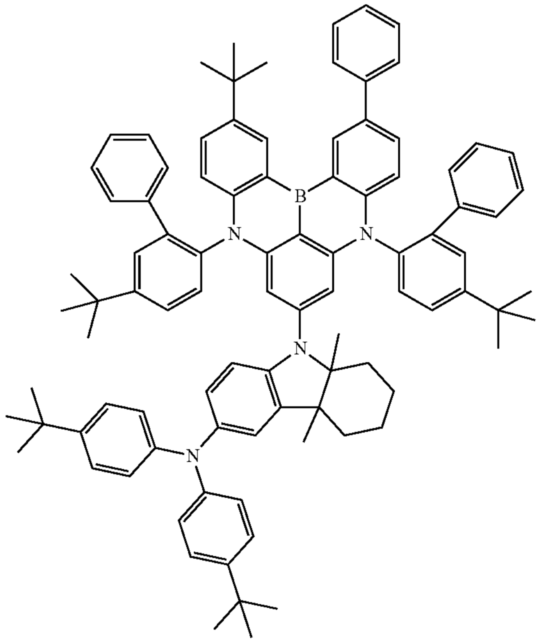
-continued
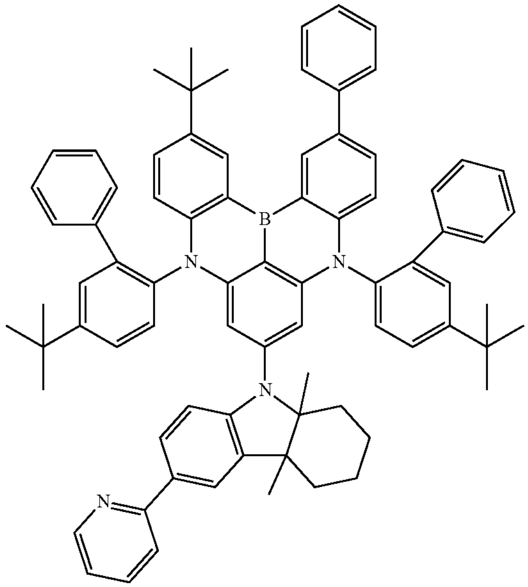
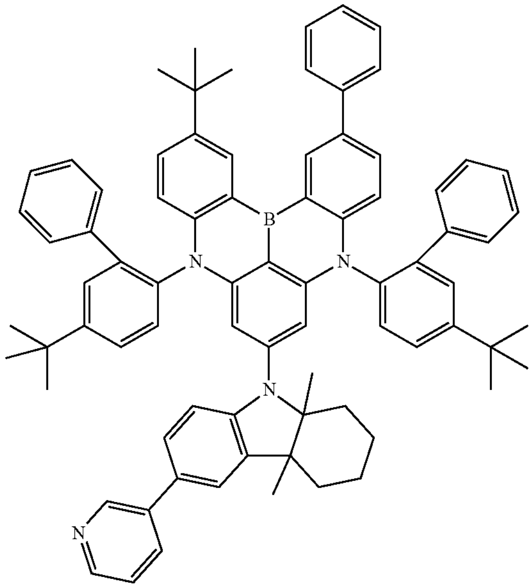

-continued
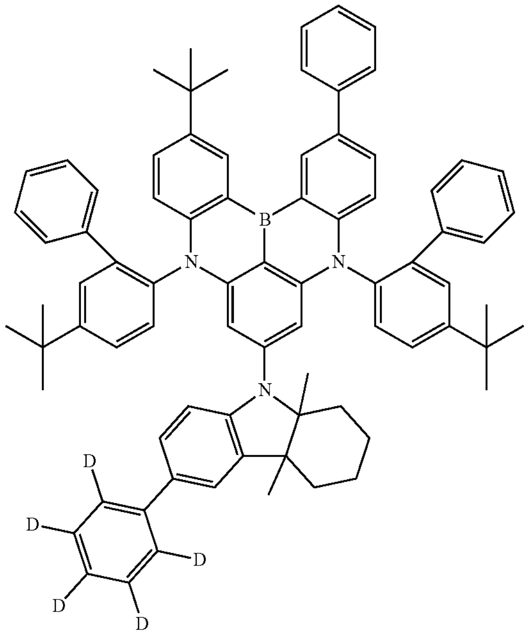
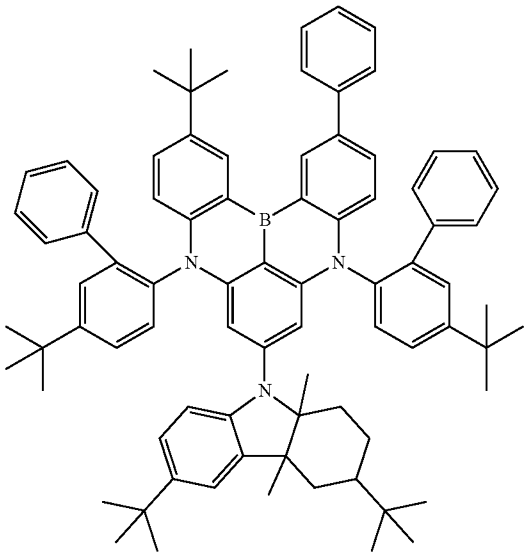
-continued
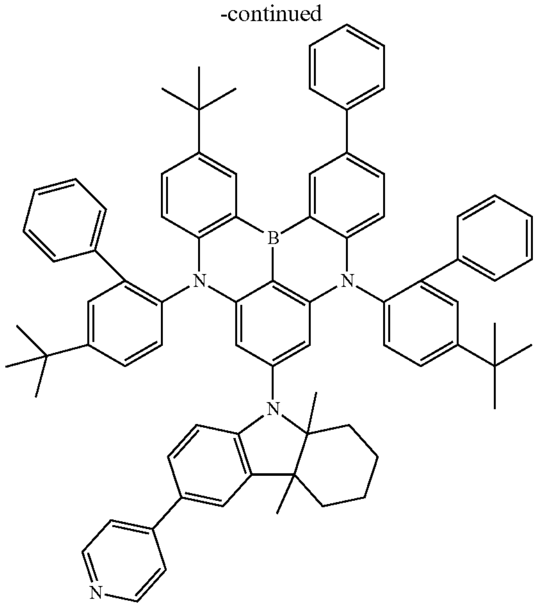
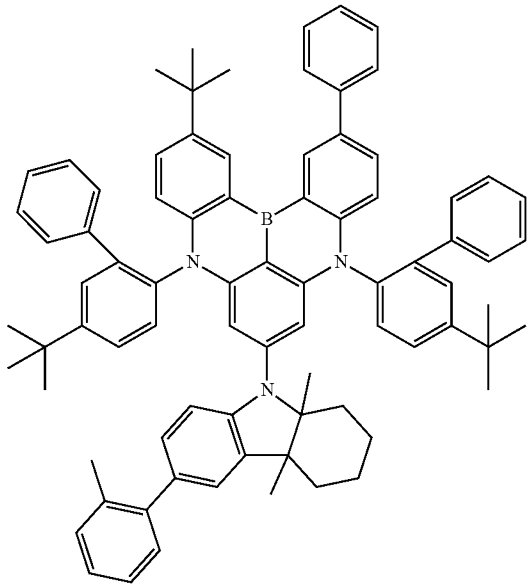
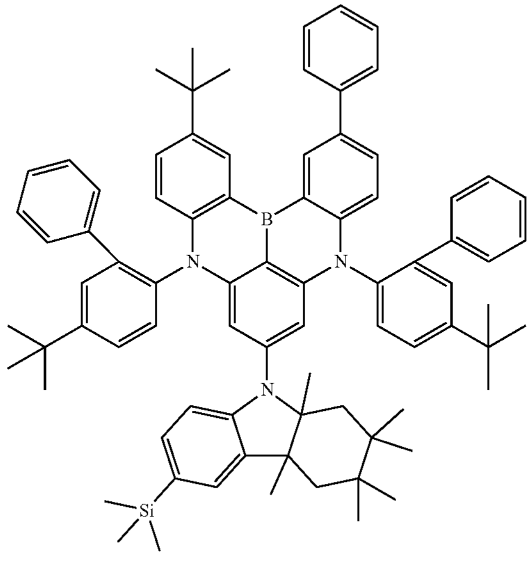

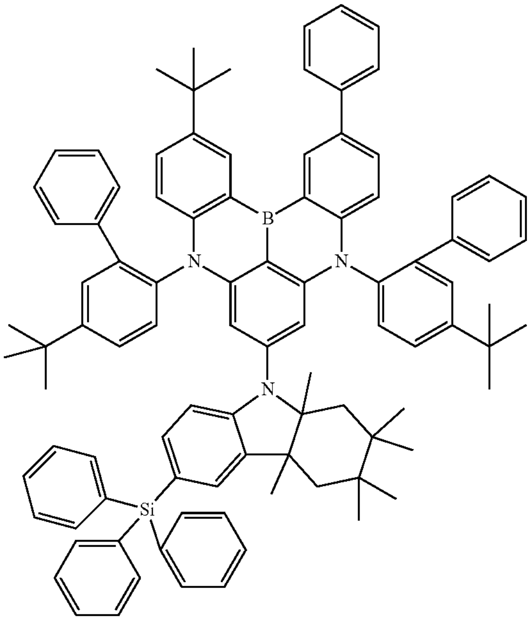
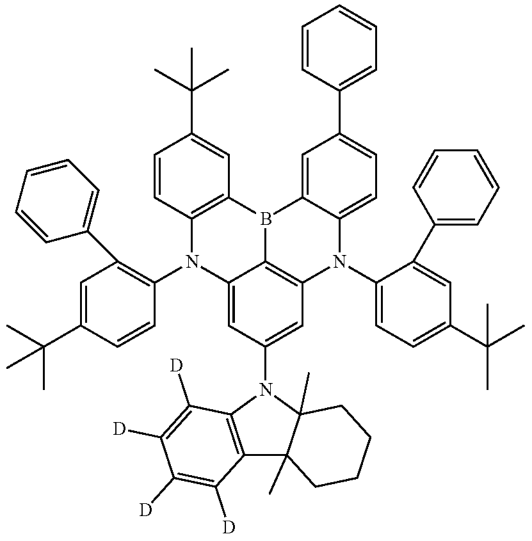
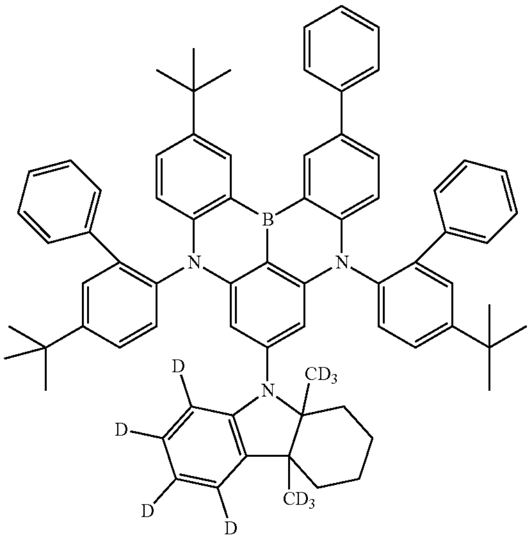
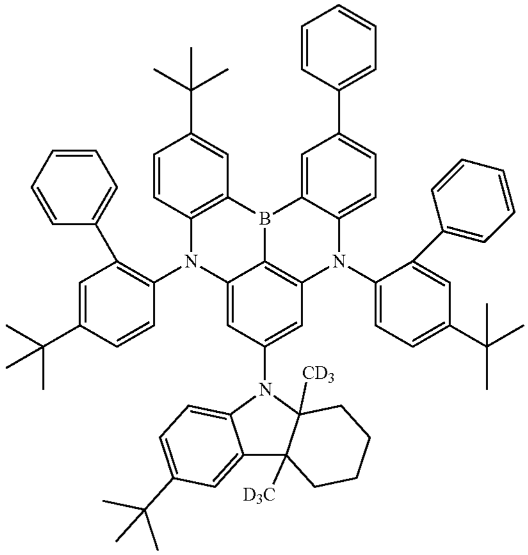
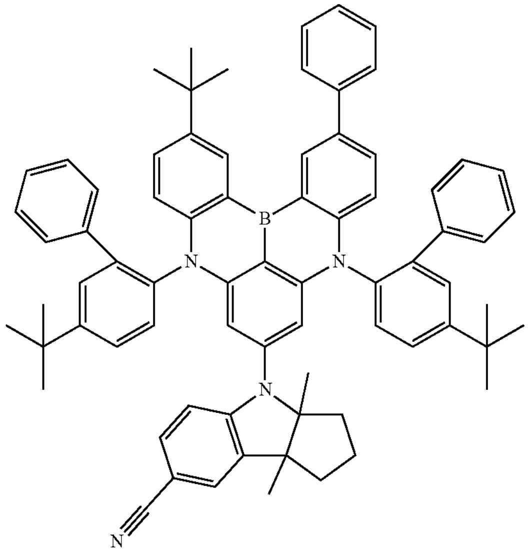
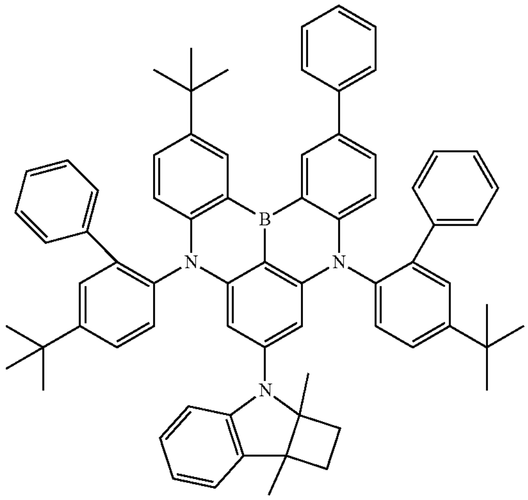

-continued
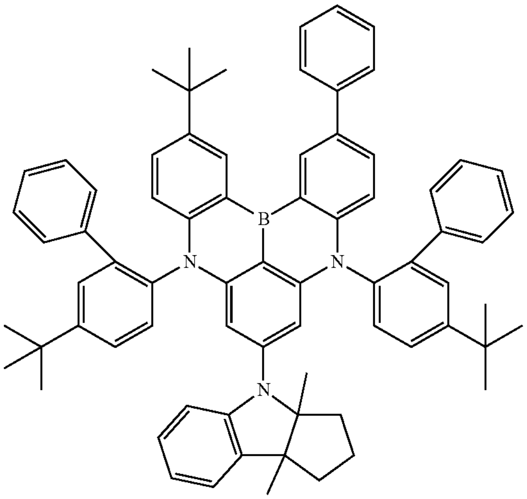
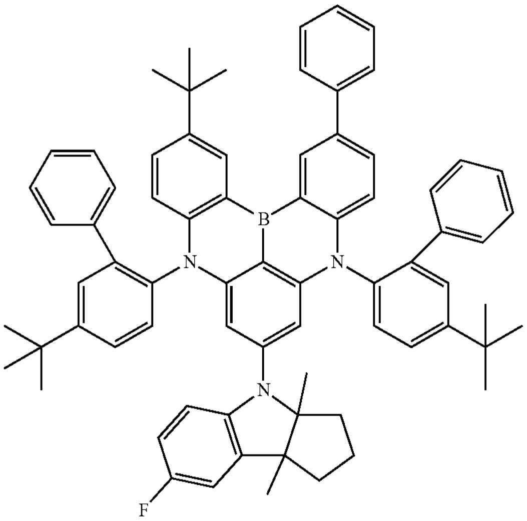
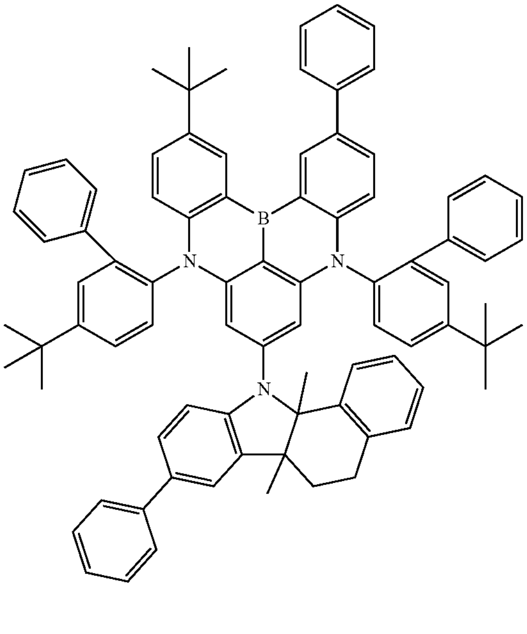
-continued
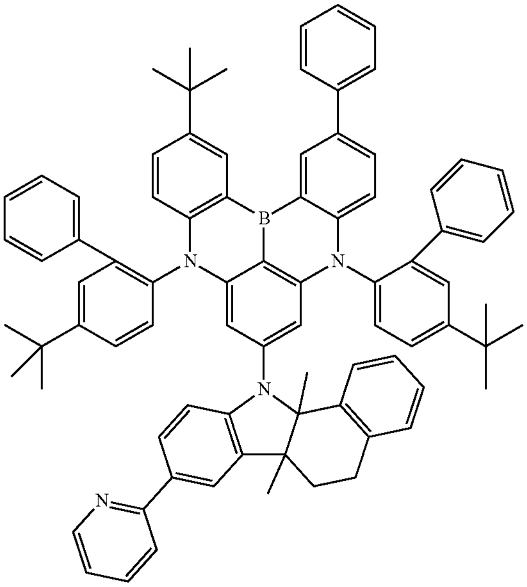
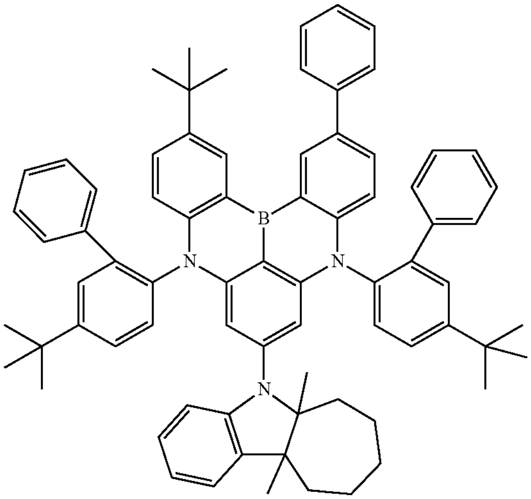
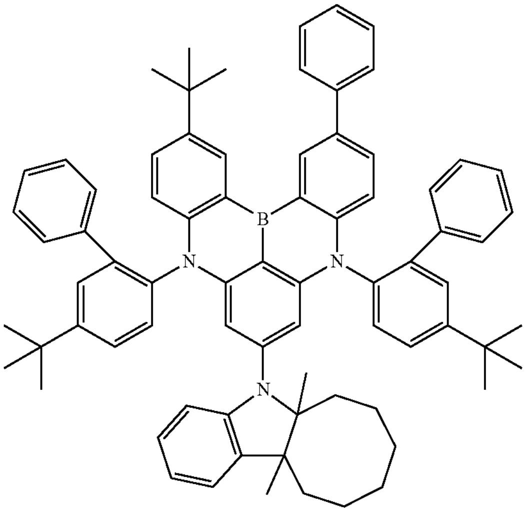

-continued
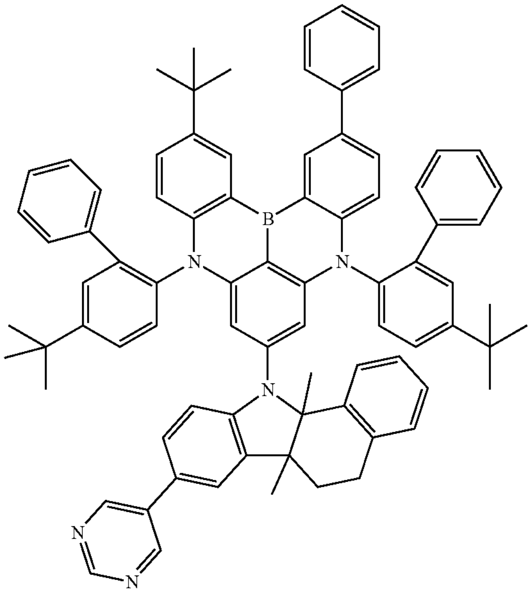
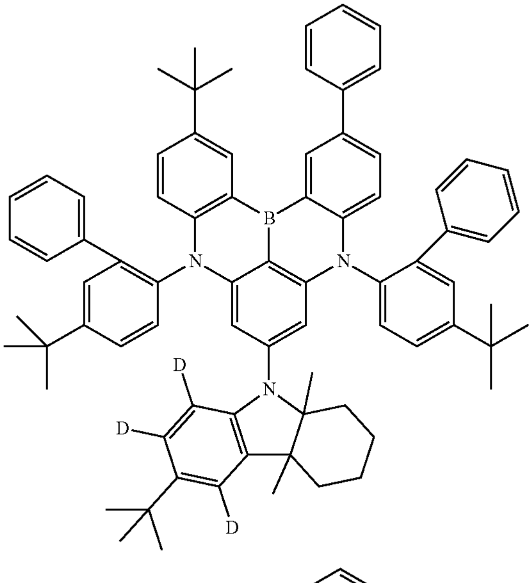
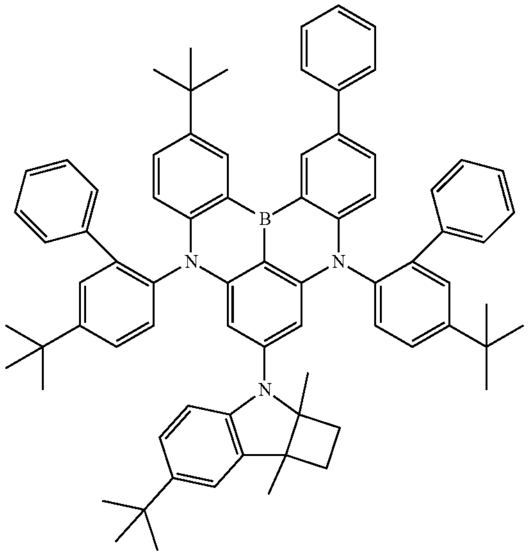
-continued
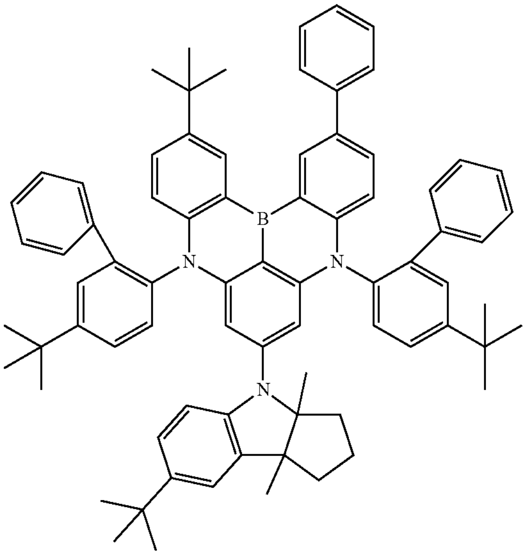
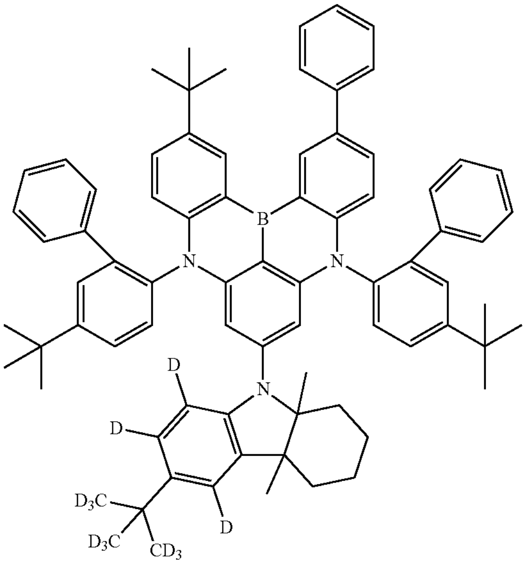
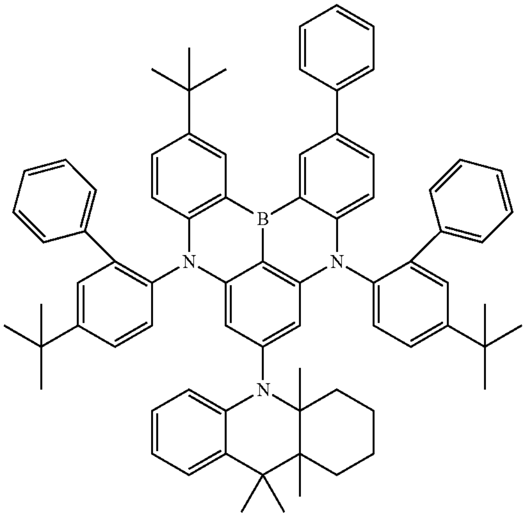

-continued
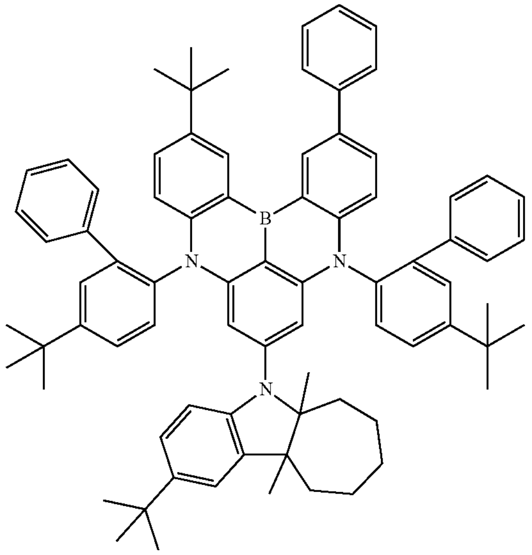
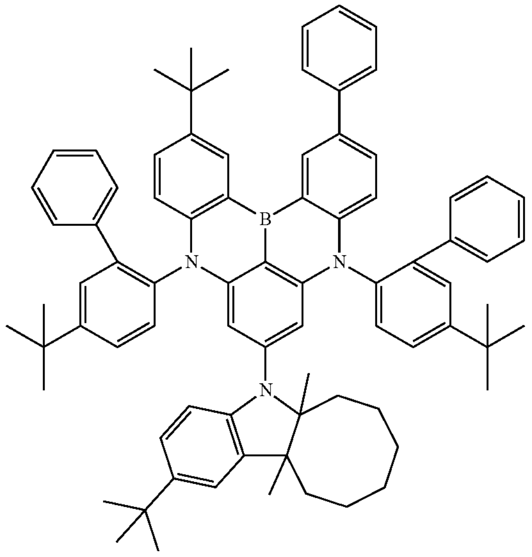
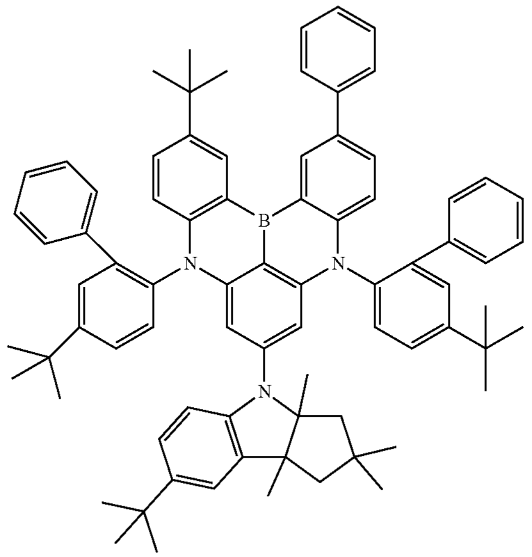
-continued
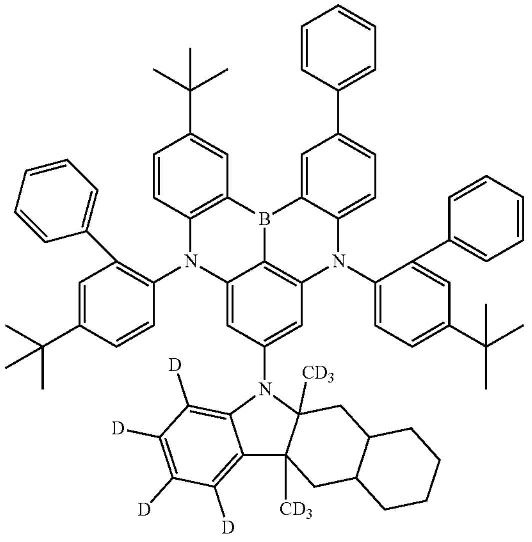
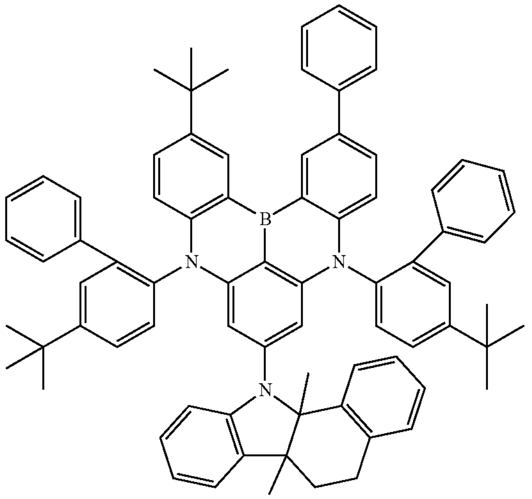
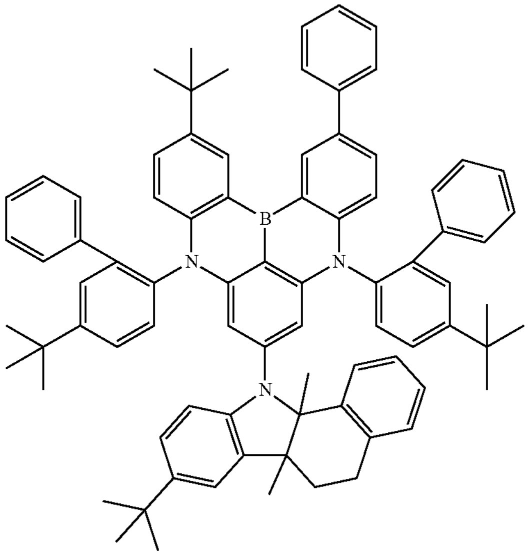

-continued
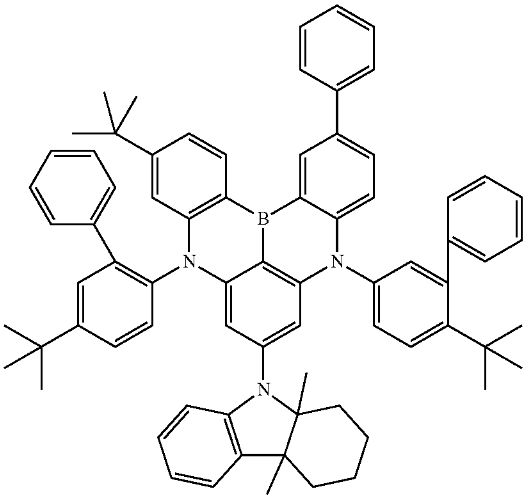
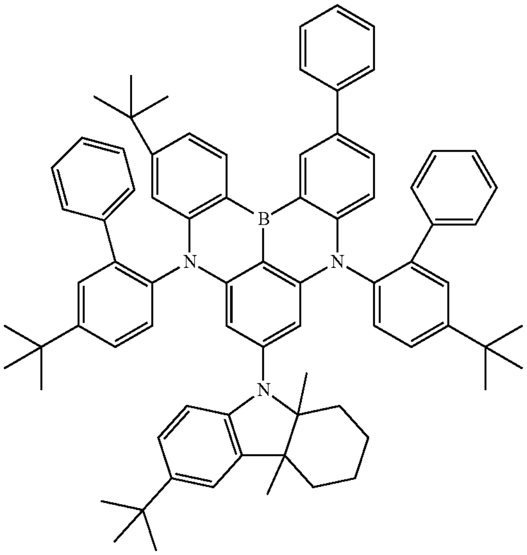
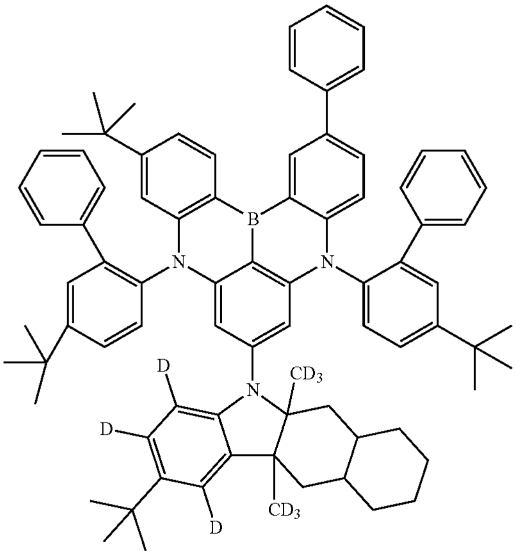
-continued
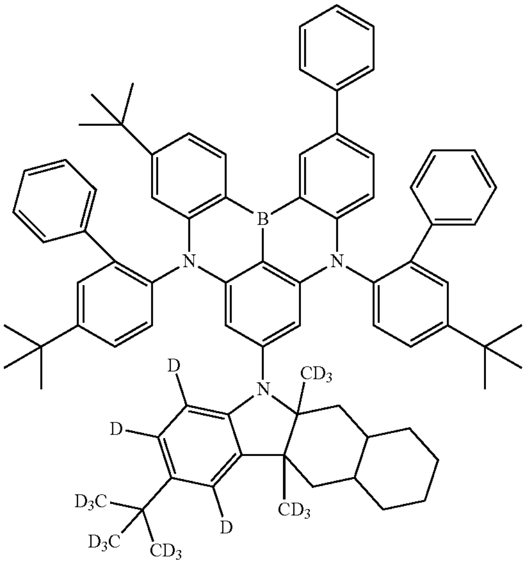
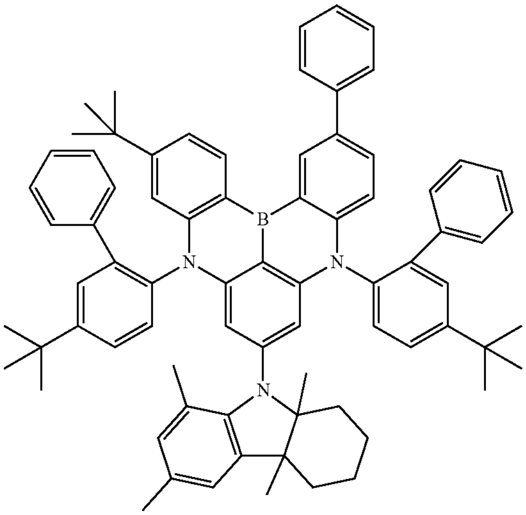
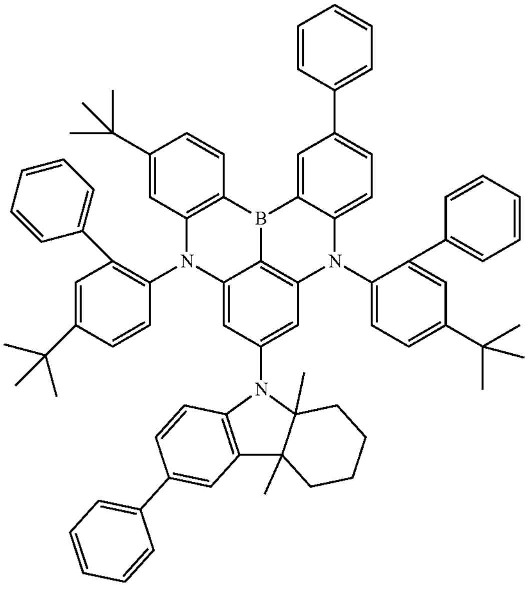

-continued
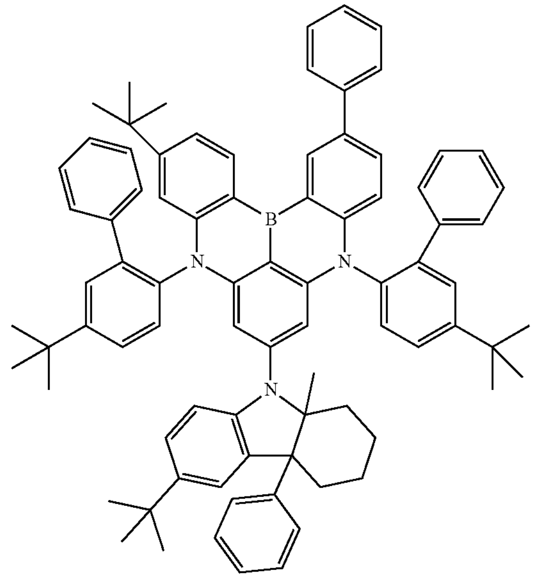
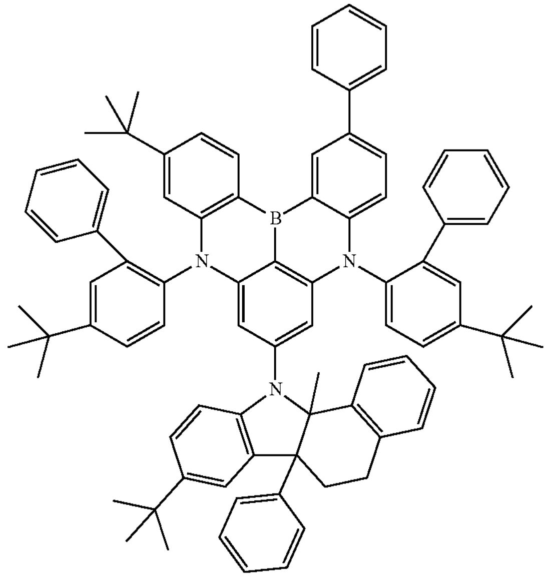
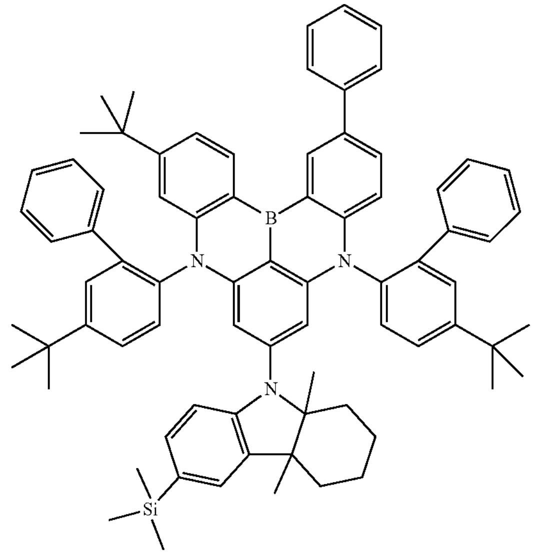
-continued
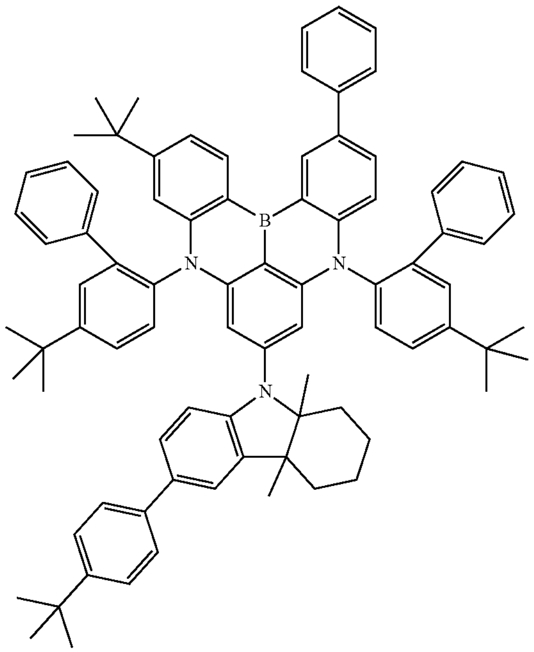
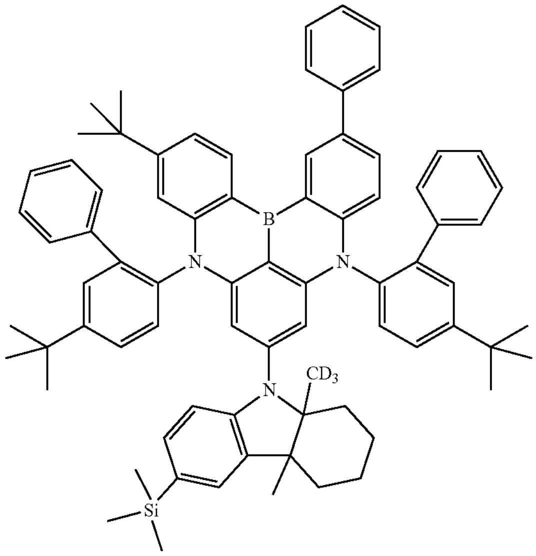

-continued
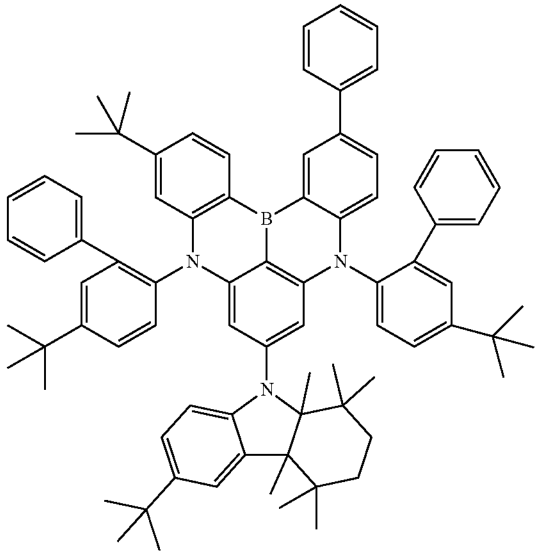
-continued
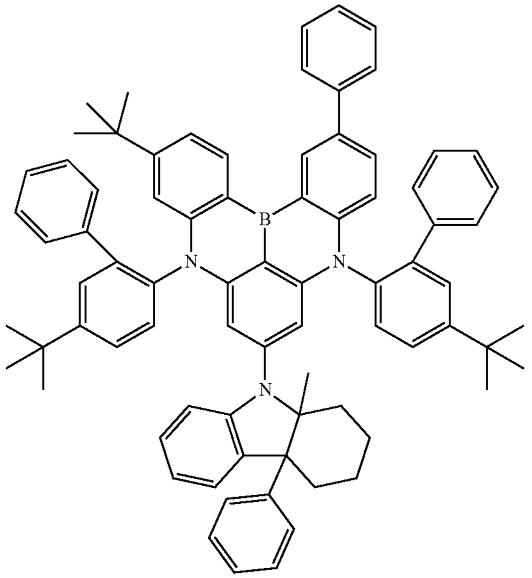
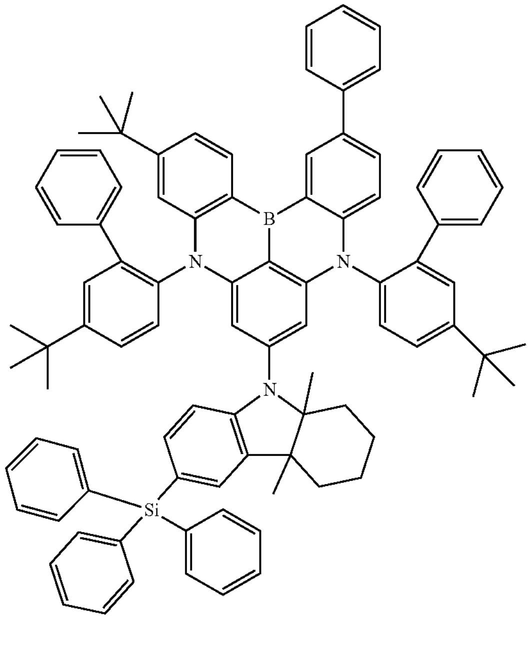
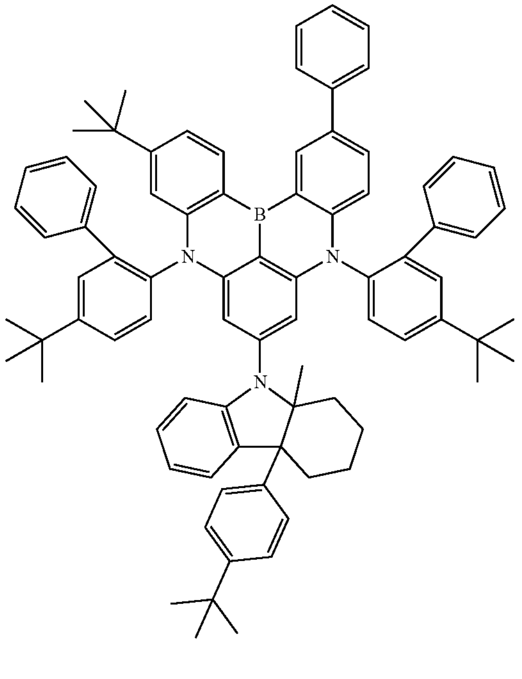

-continued
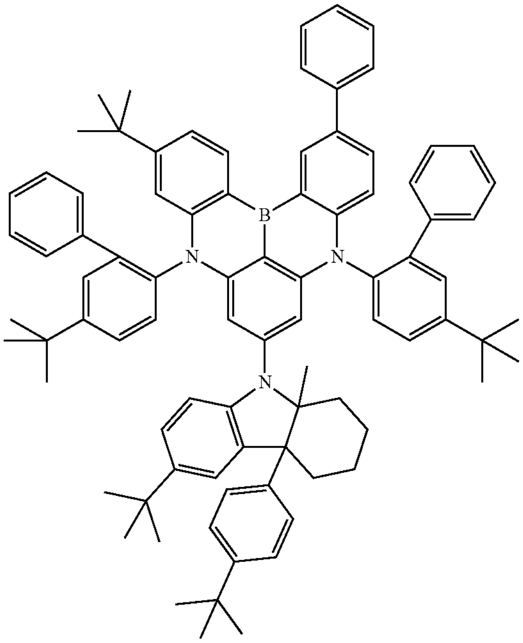
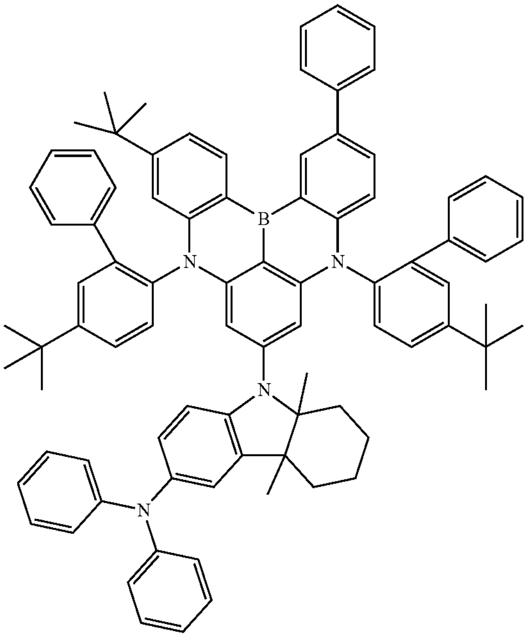
-continued
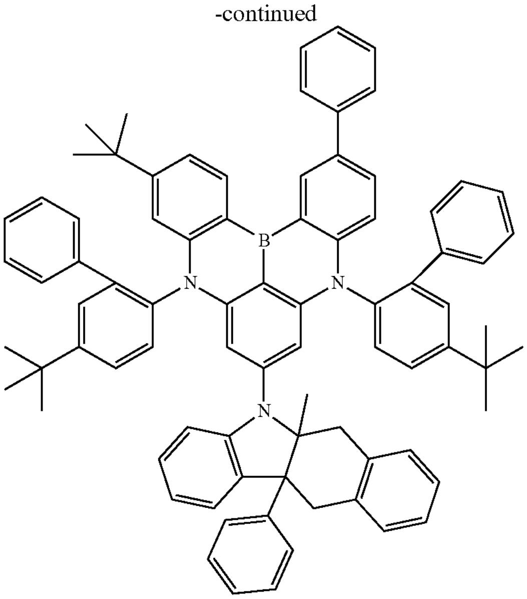
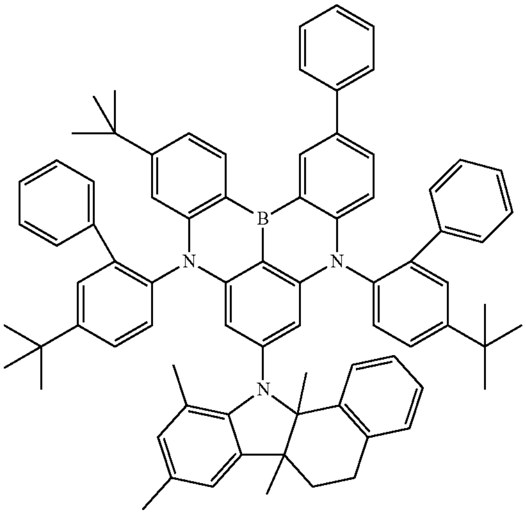
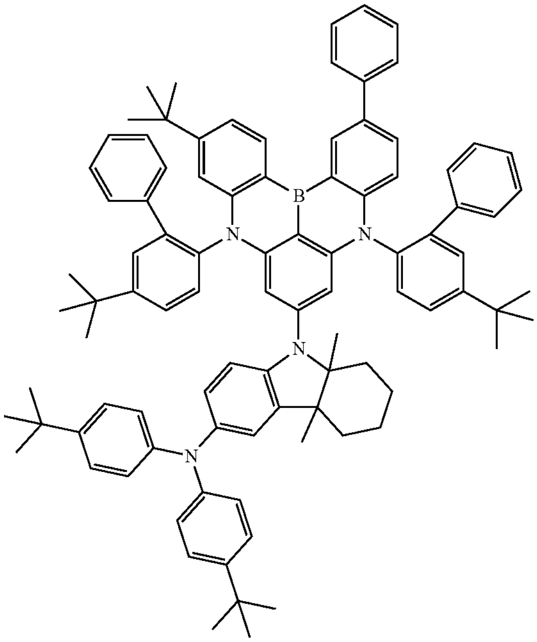

-continued
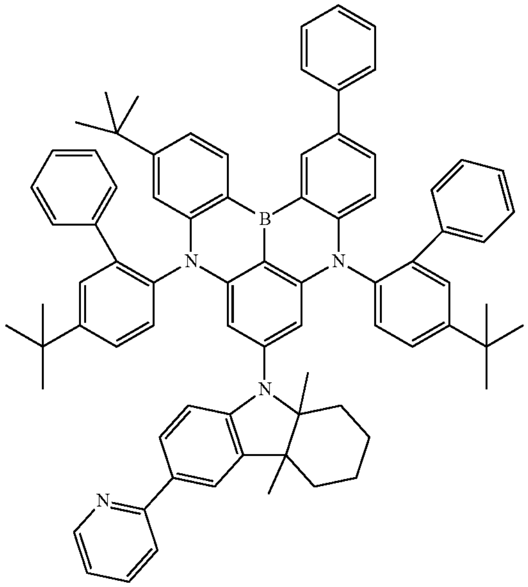
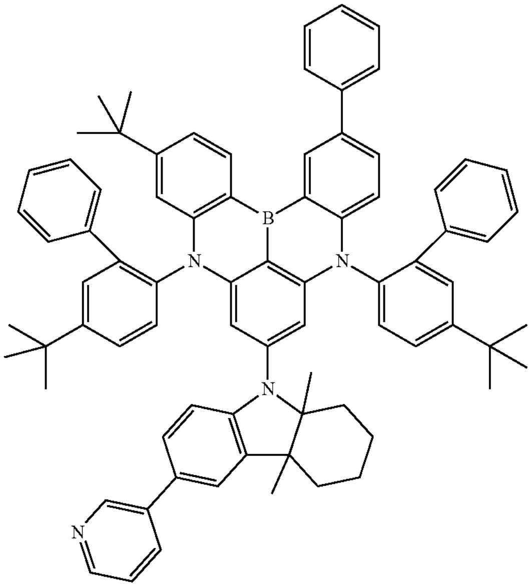
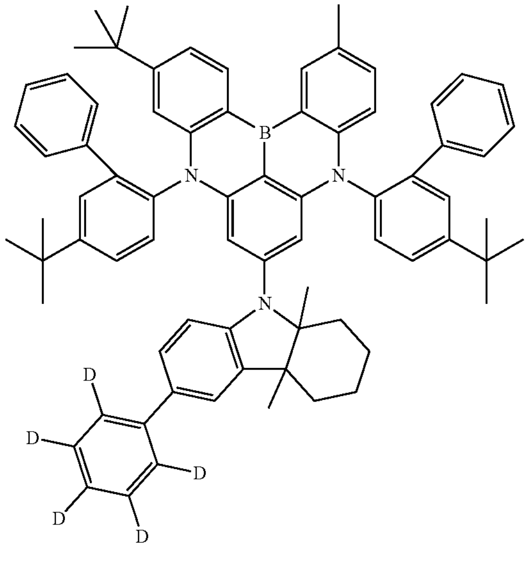
-continued
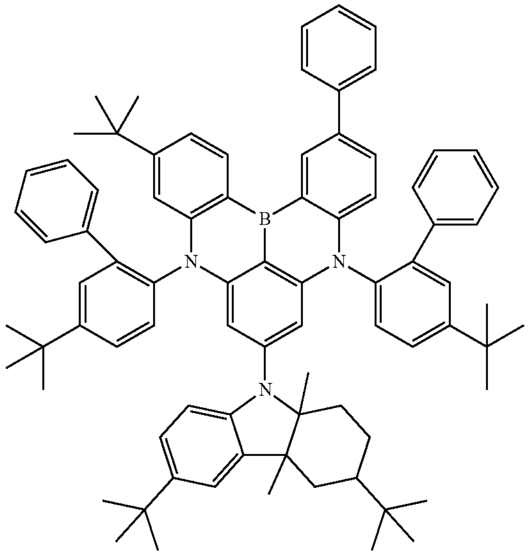
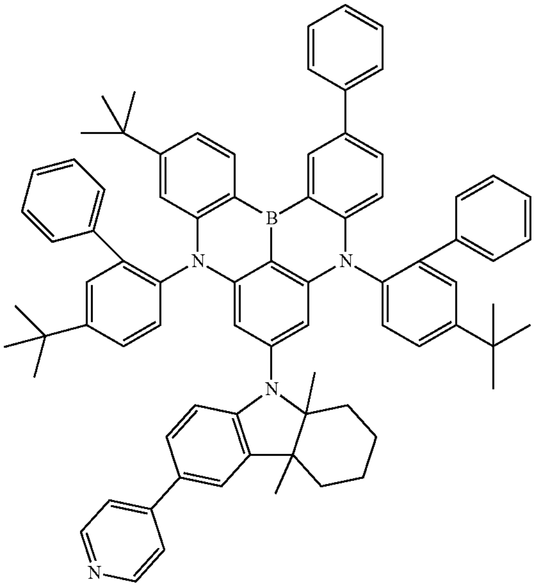
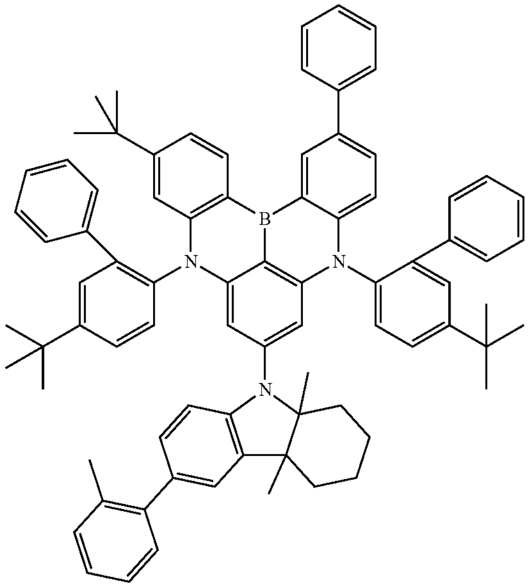

-continued
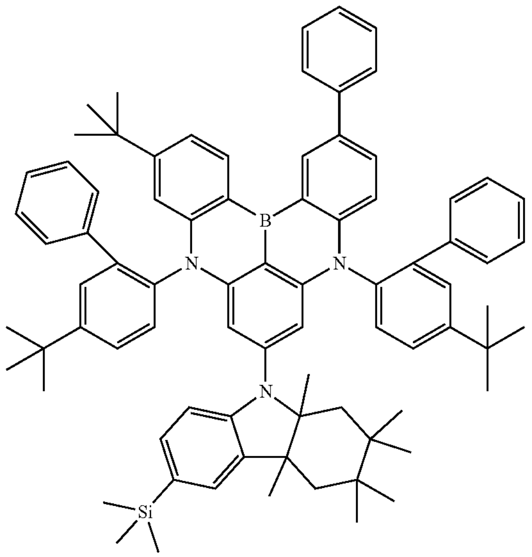
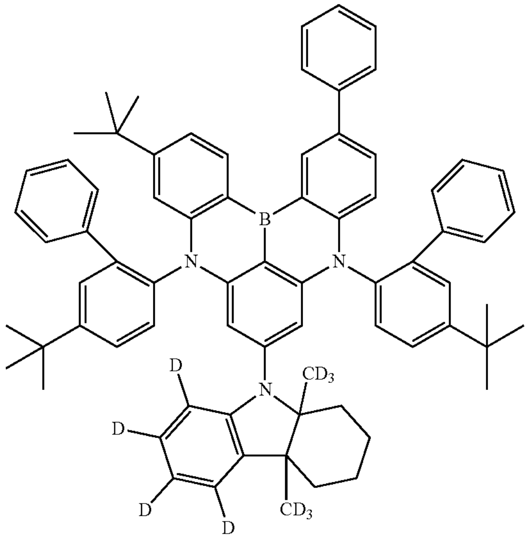
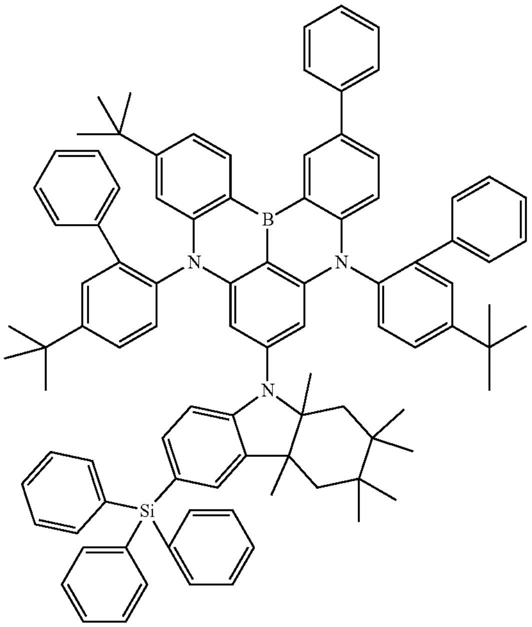
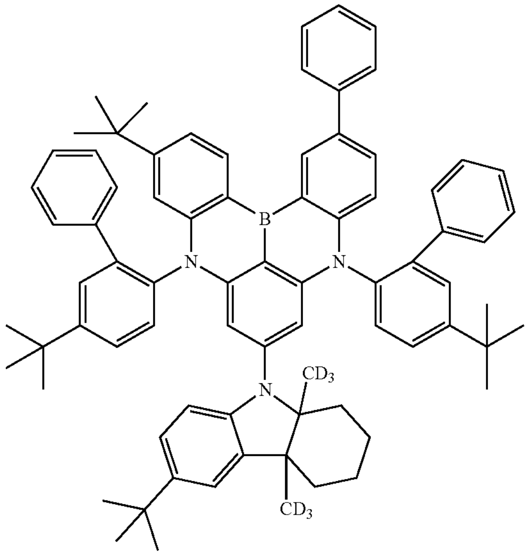
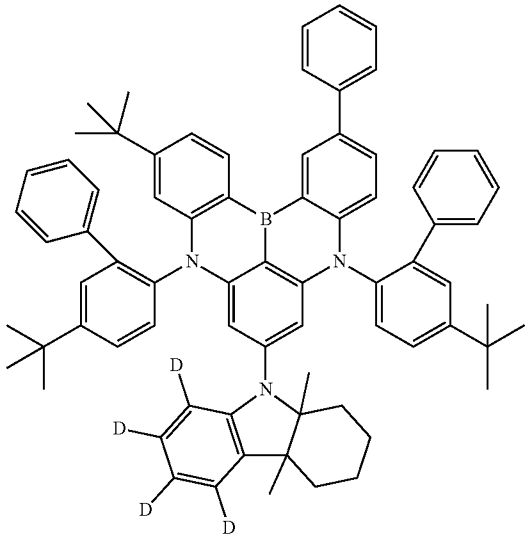
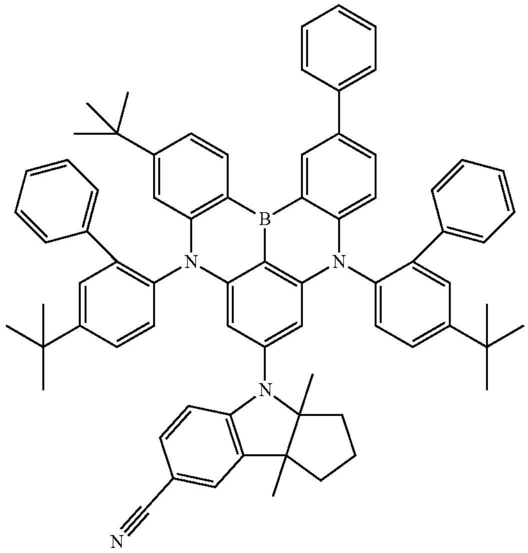
-continued -continued
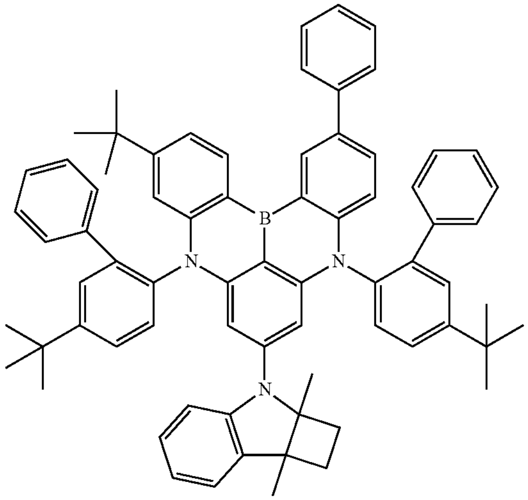
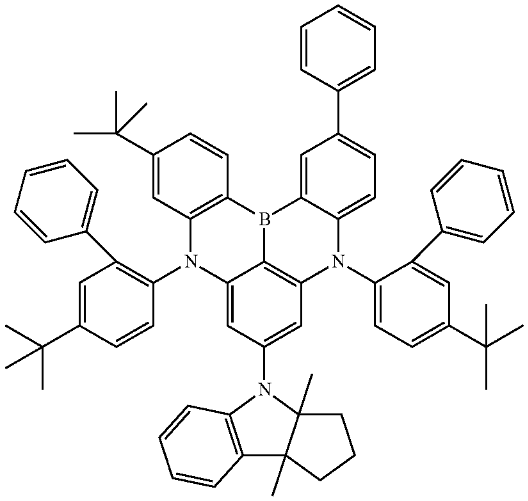
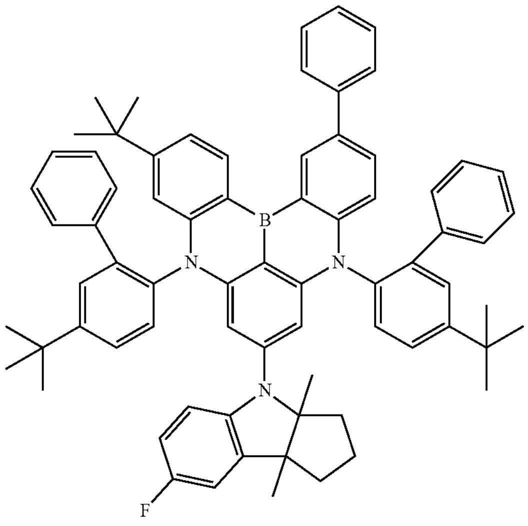
-continued
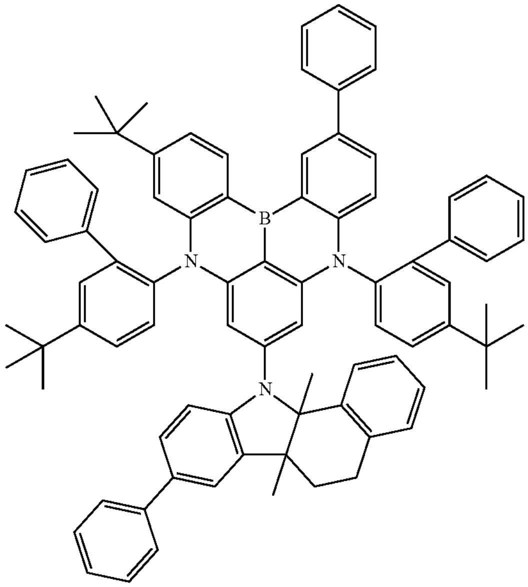
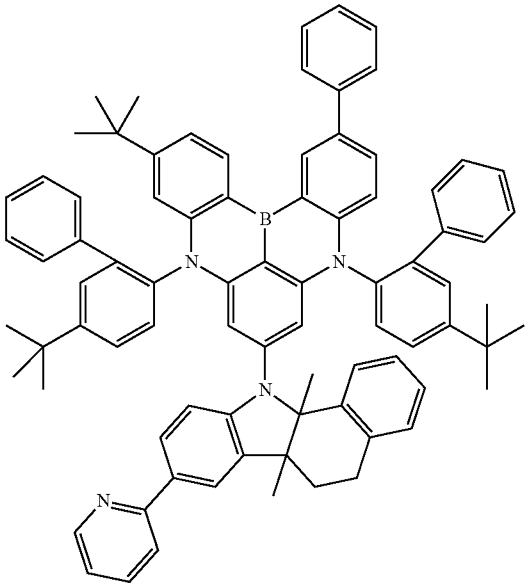
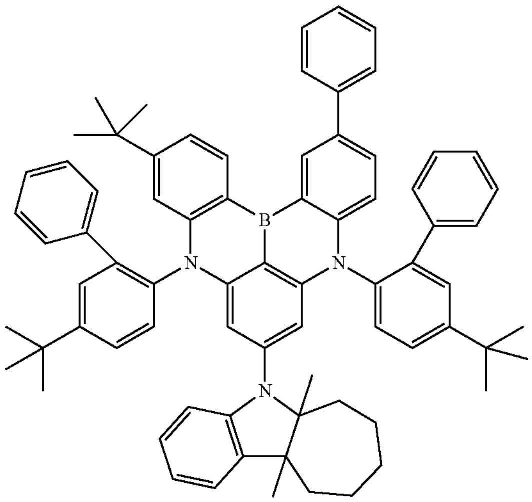

-continued
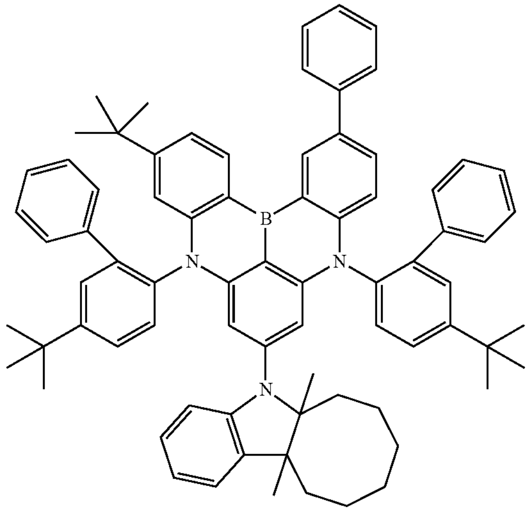
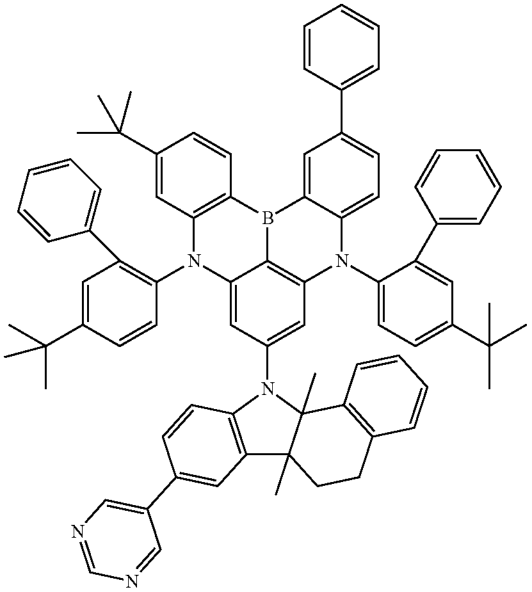
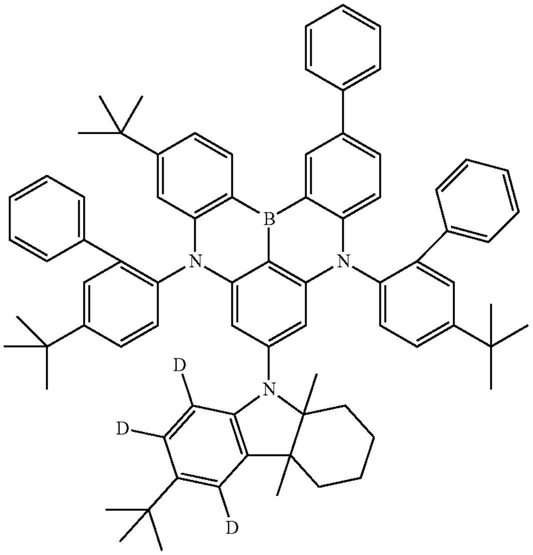
-continued
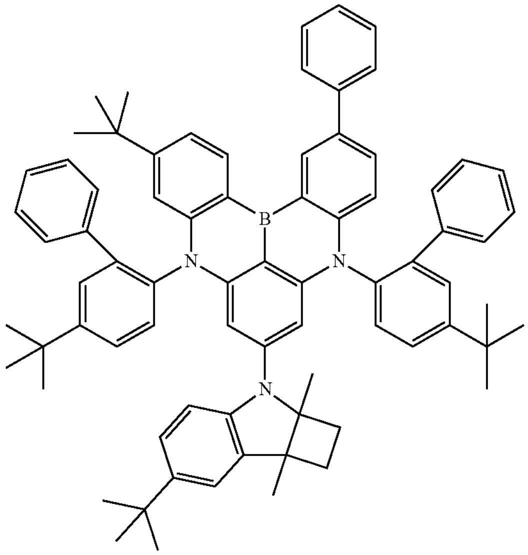
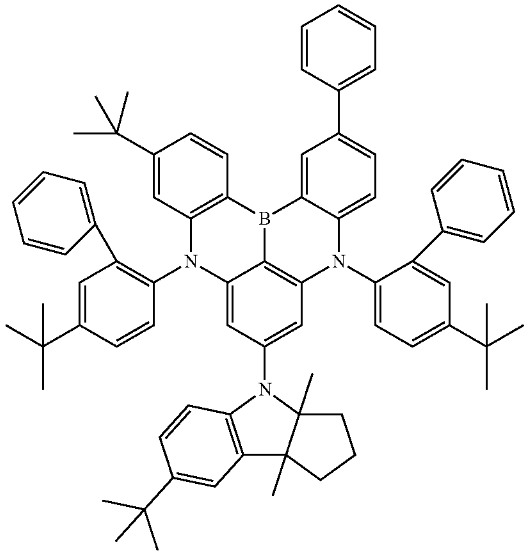
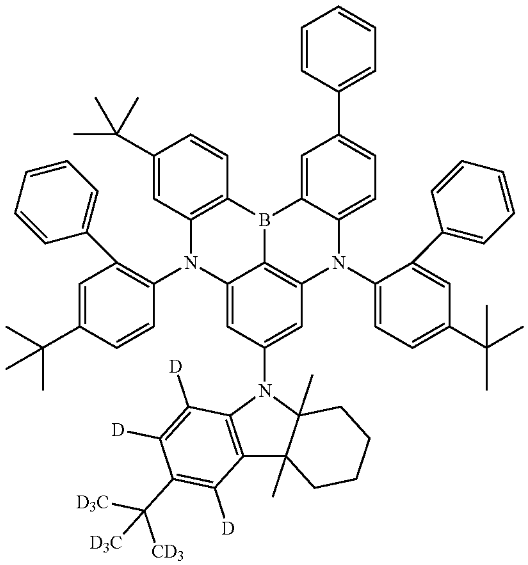

-continued
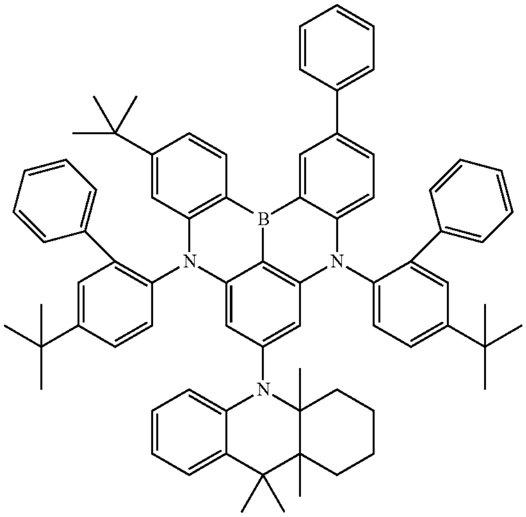
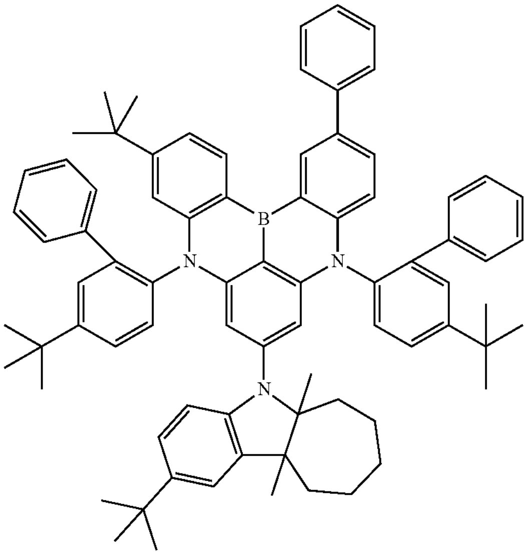
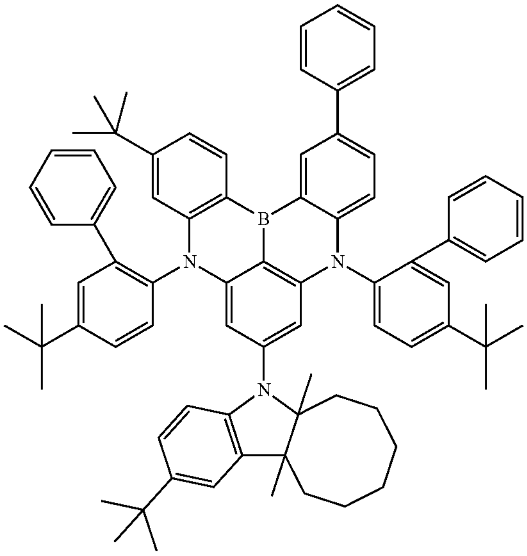
-continued
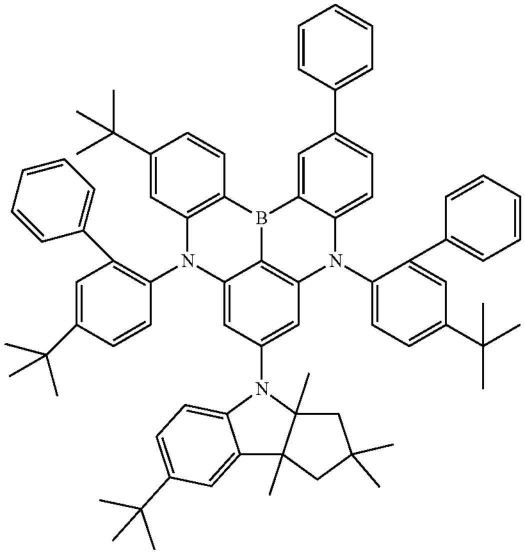
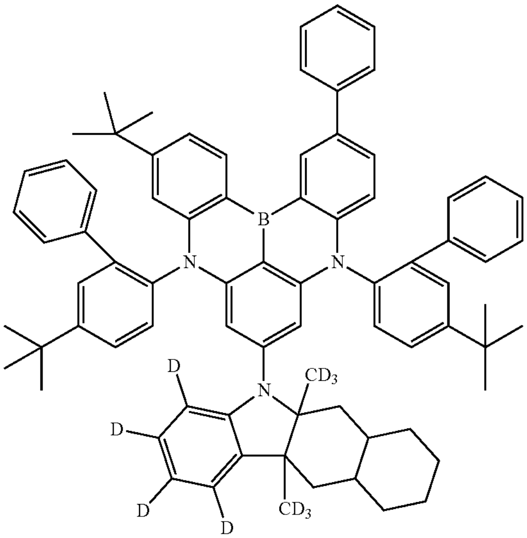
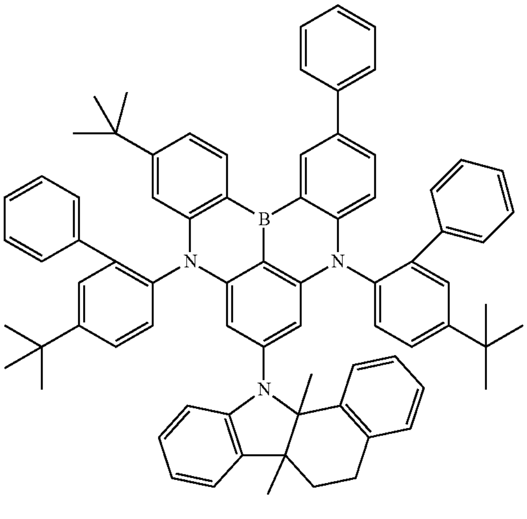

-continued
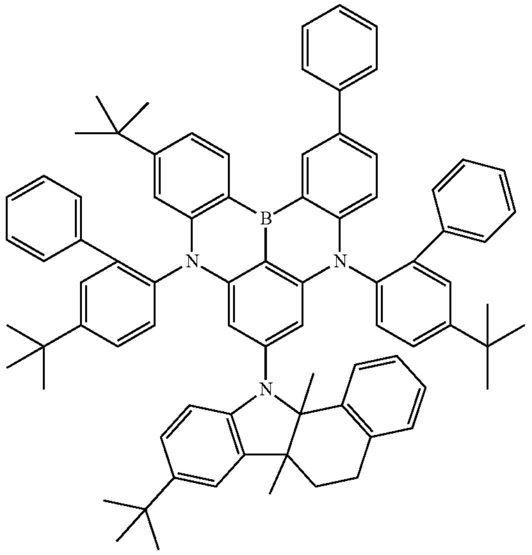
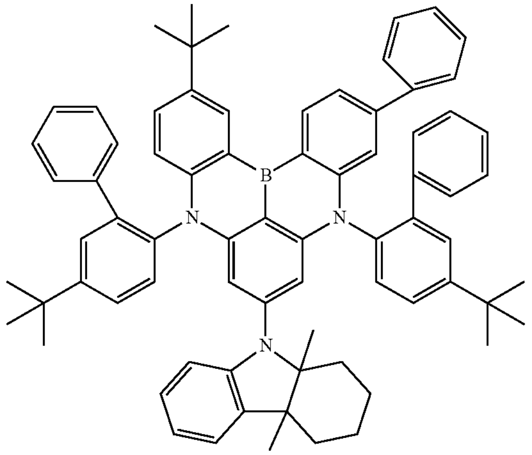
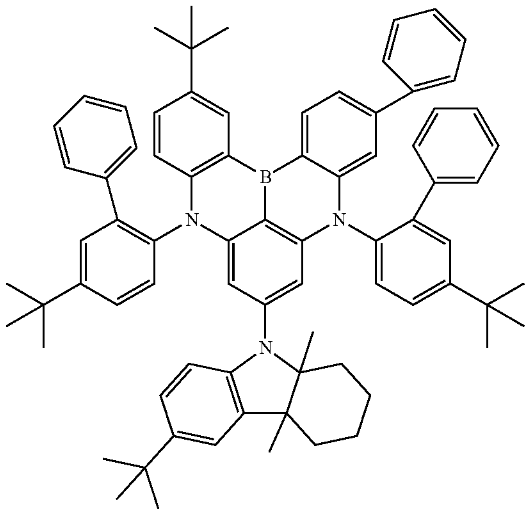
-continued
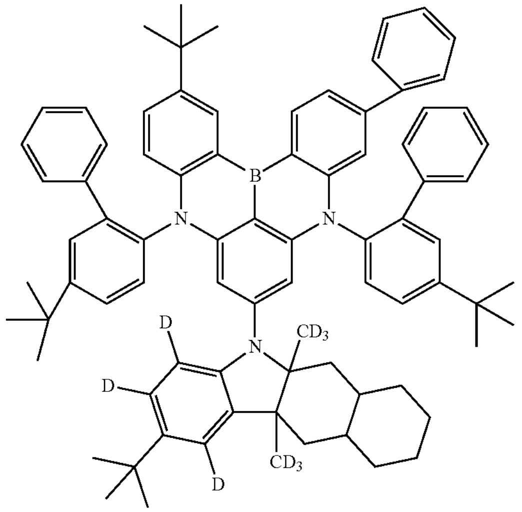
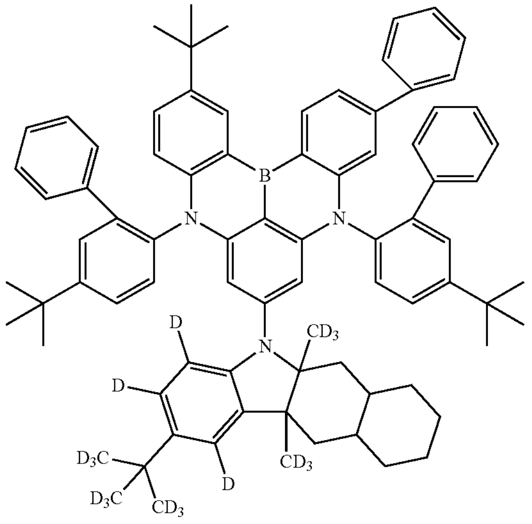
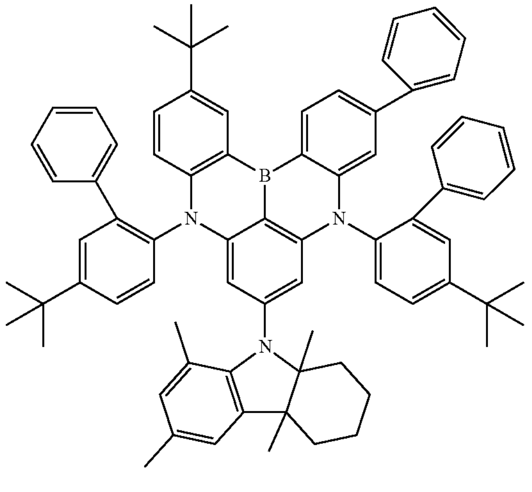

-continued
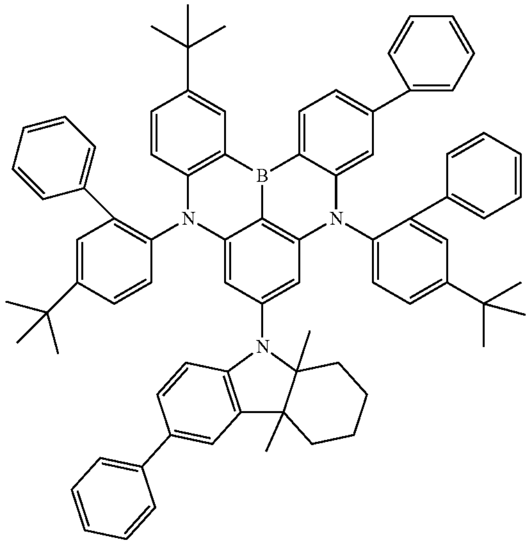
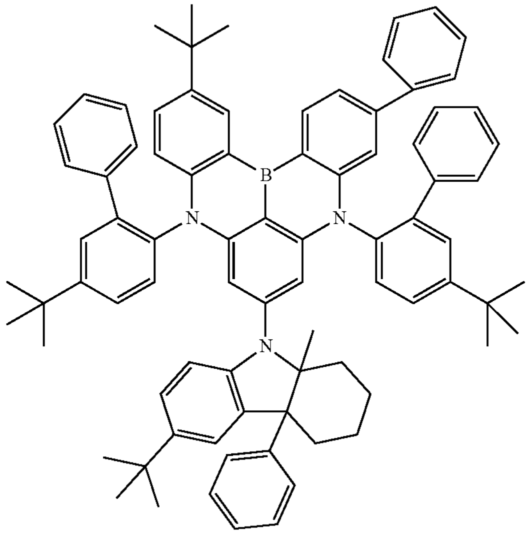
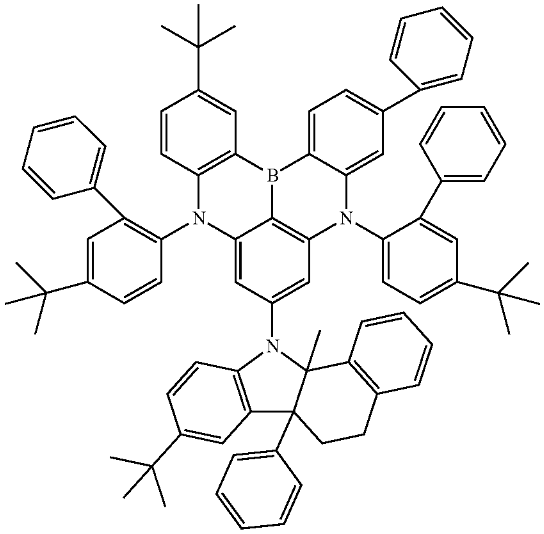
-continued
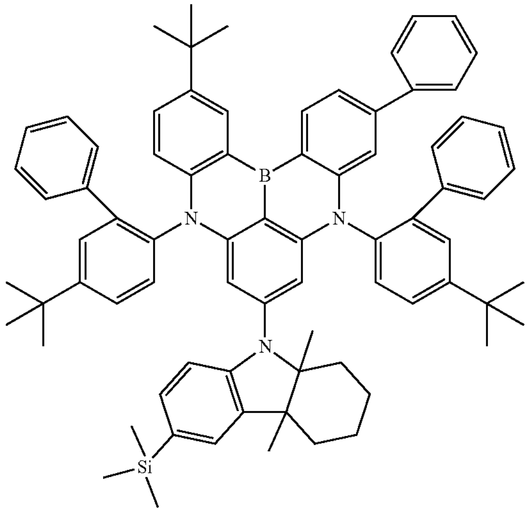
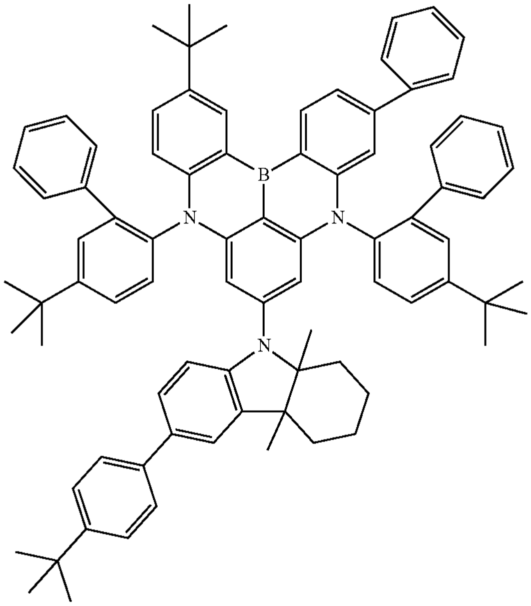
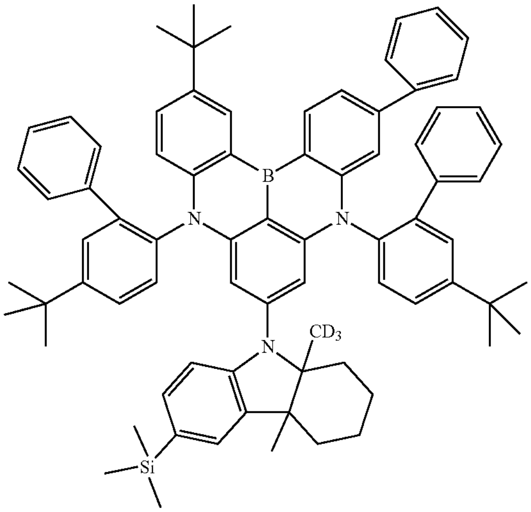

-continued
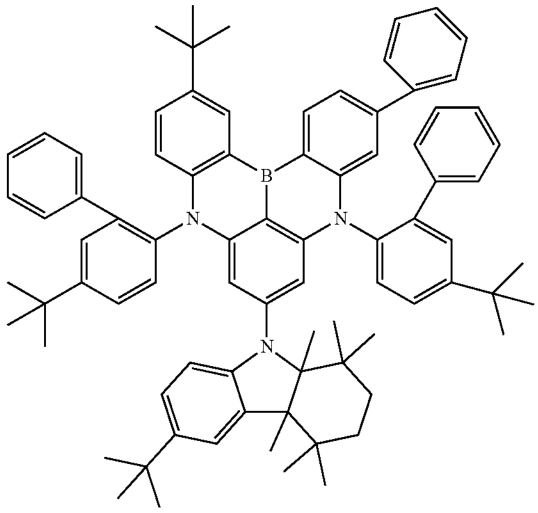
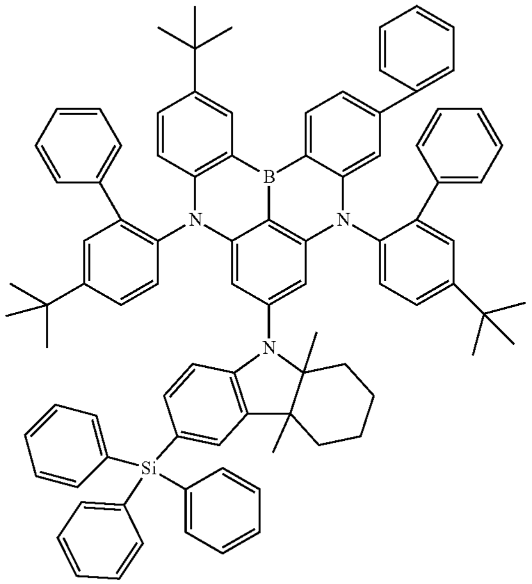
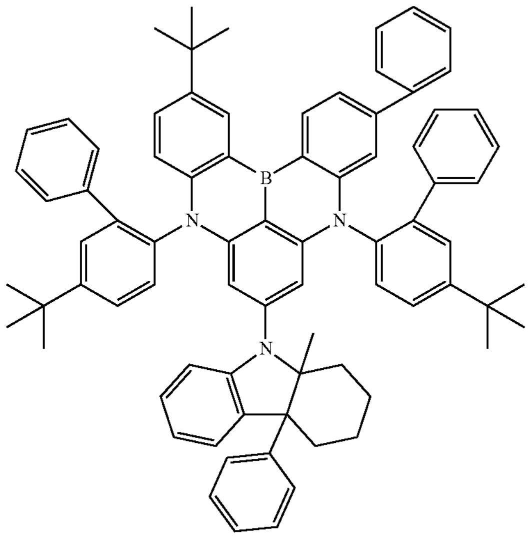
-continued
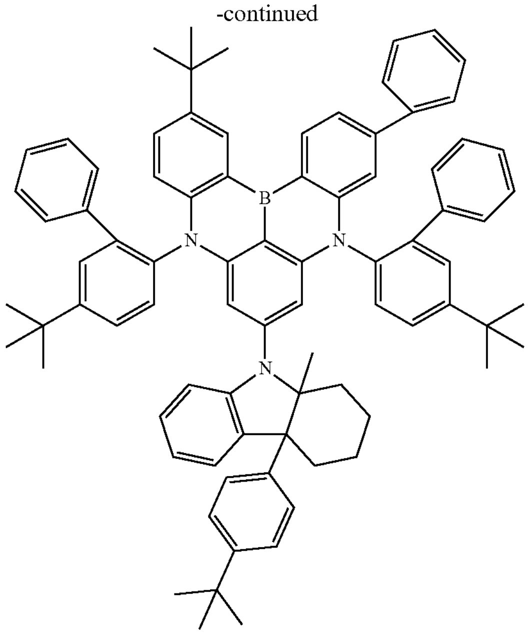
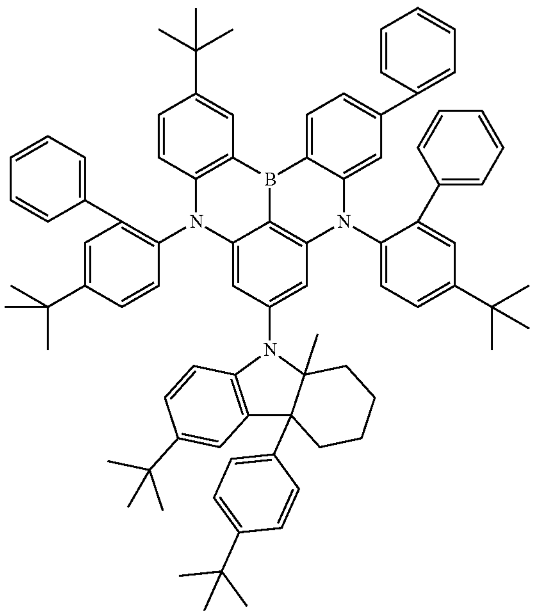

-continued
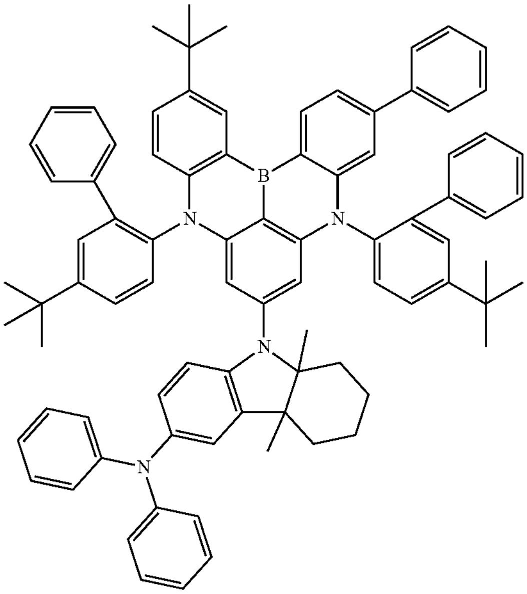
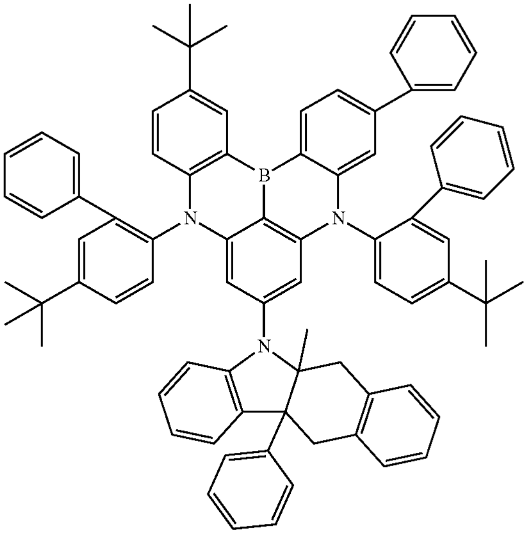
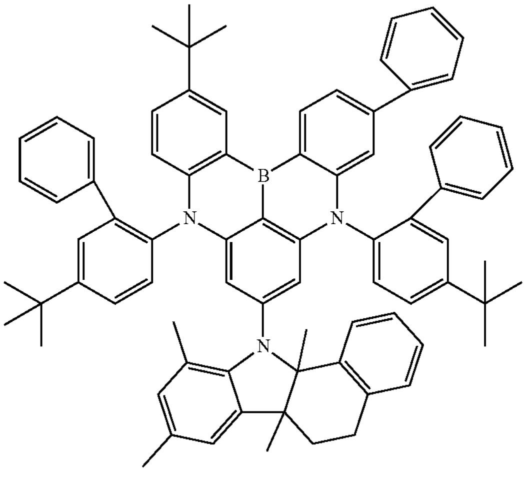
-continued
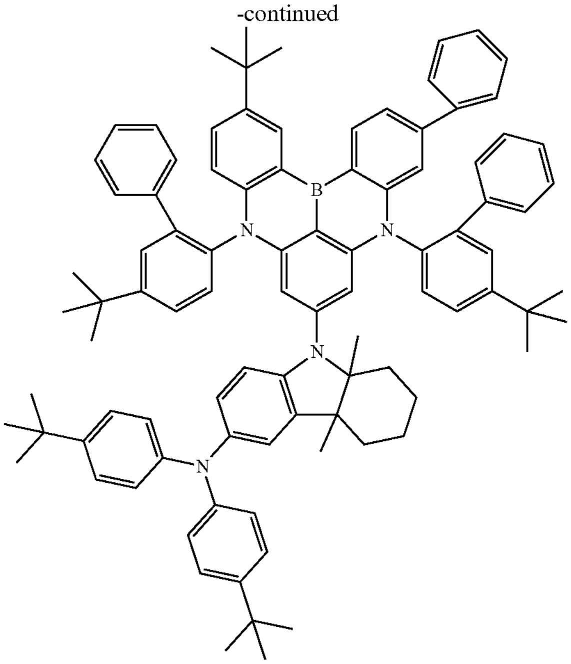
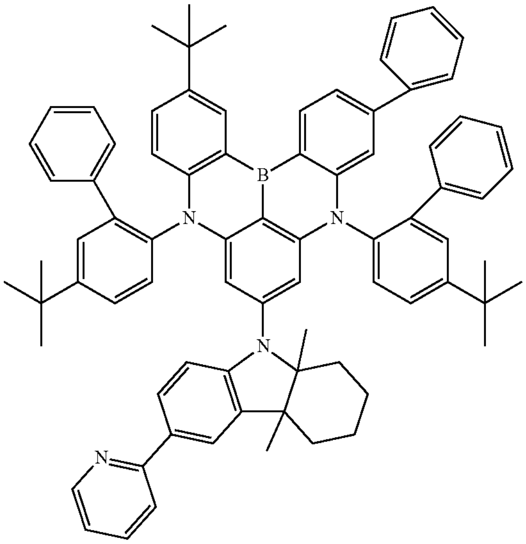
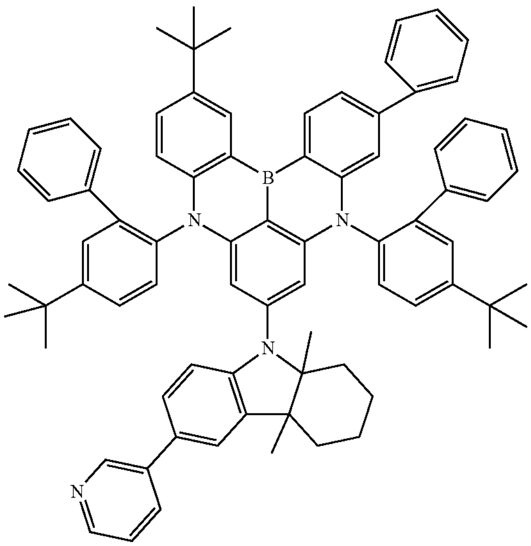

-continued
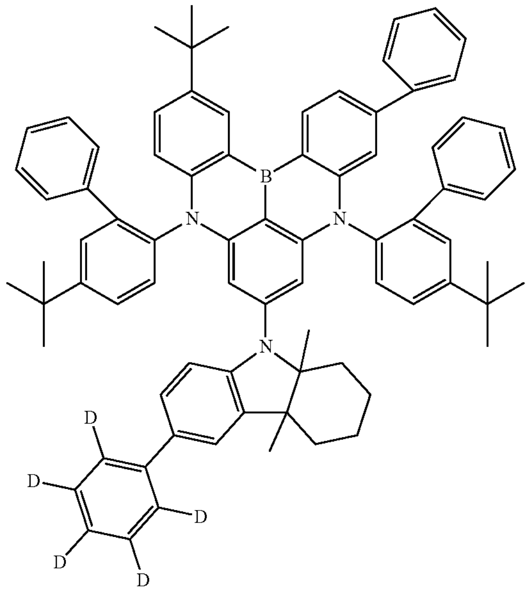
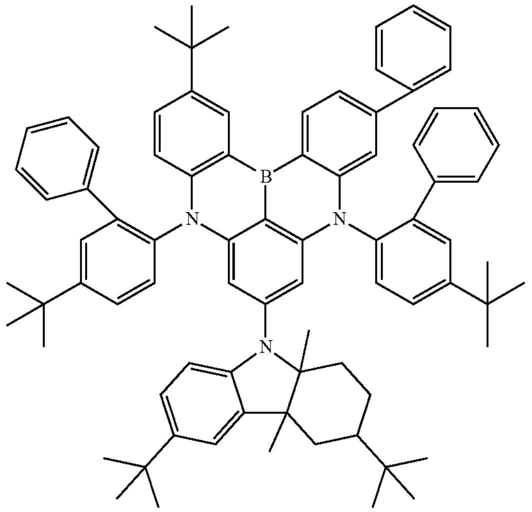
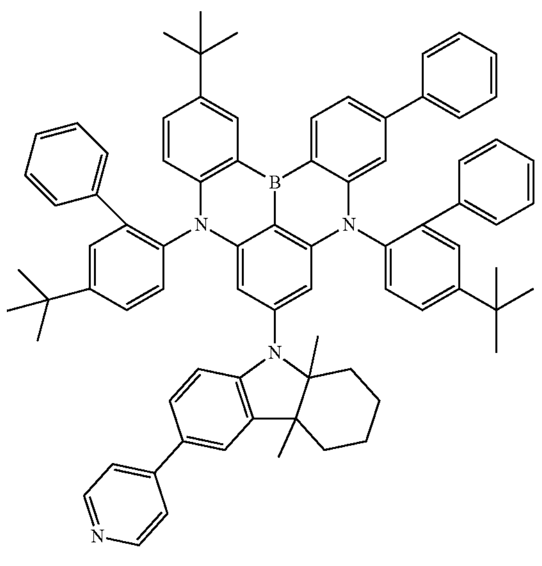
-continued
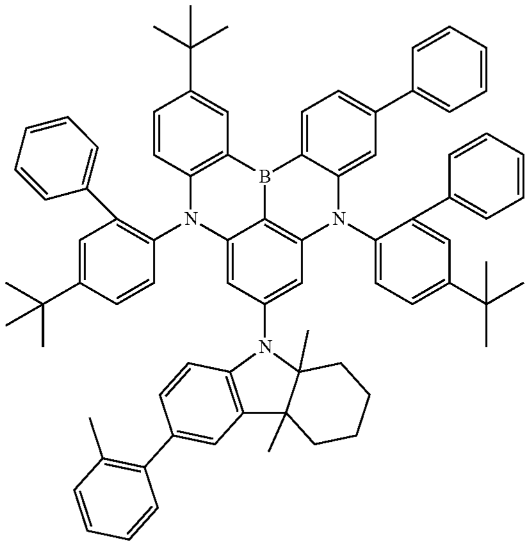
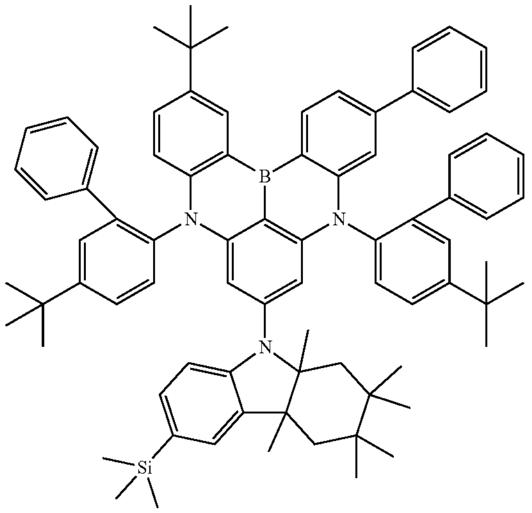
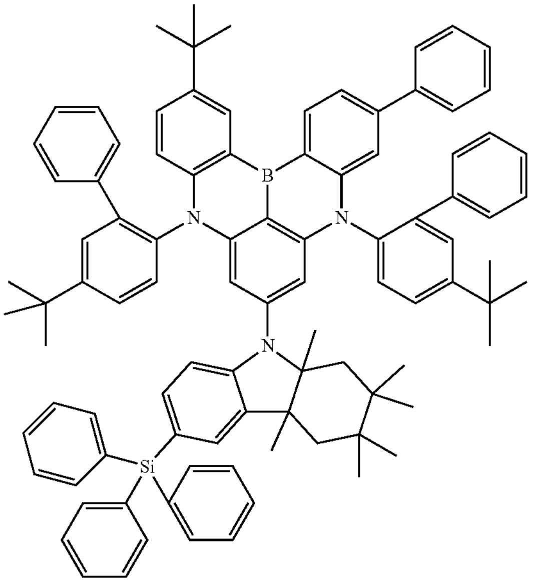

-continued
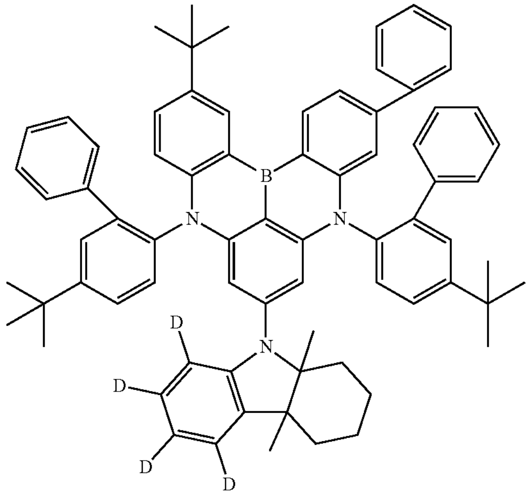
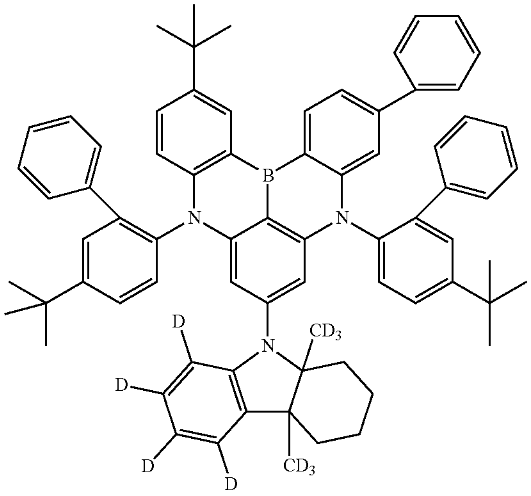
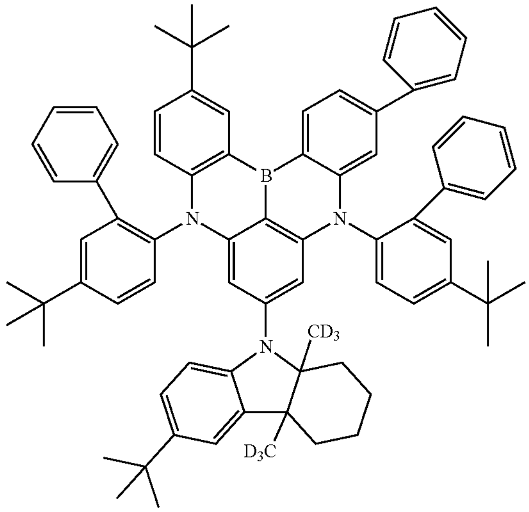
-continued
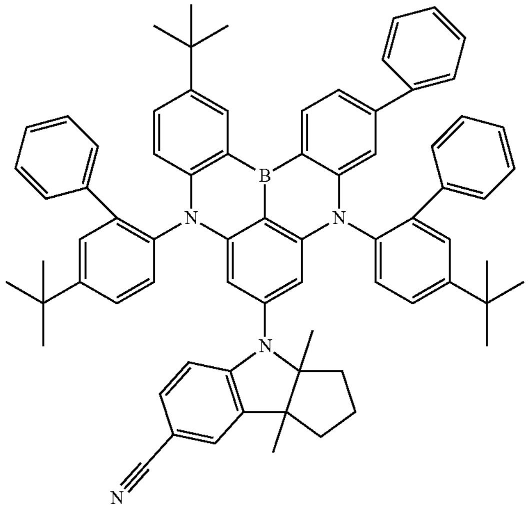
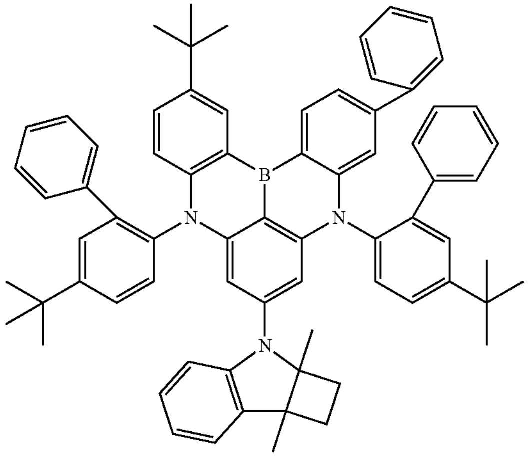
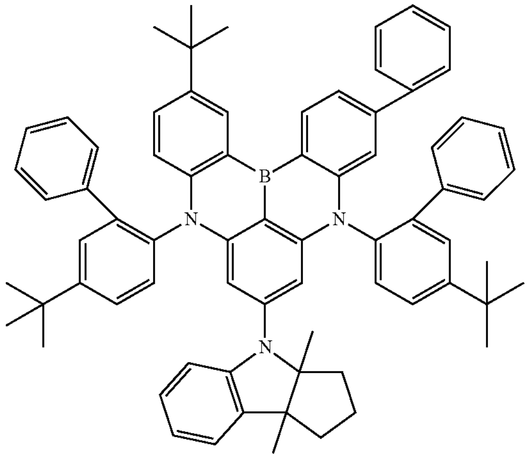

-continued
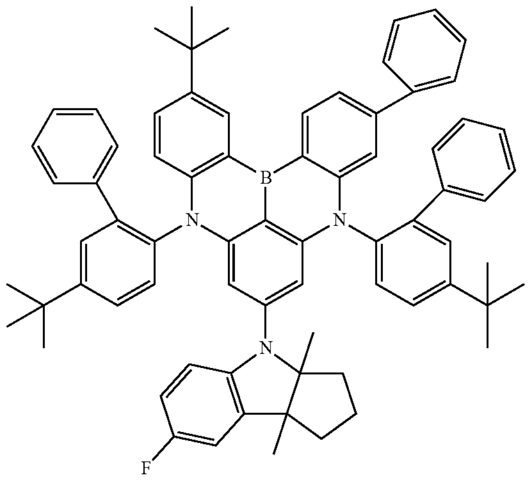
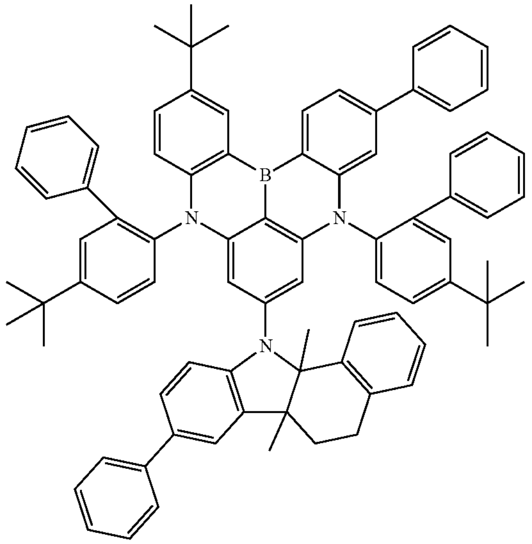
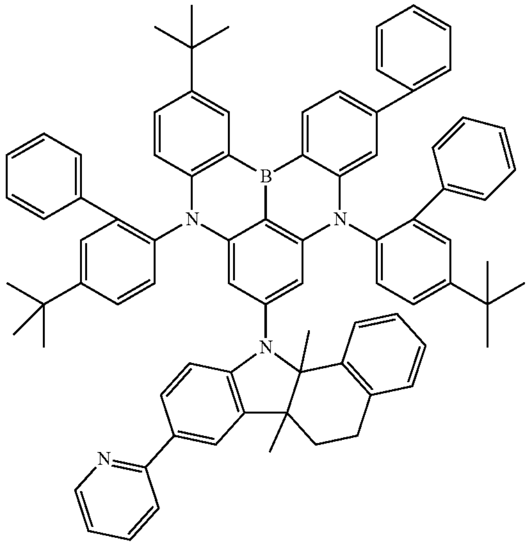
-continued
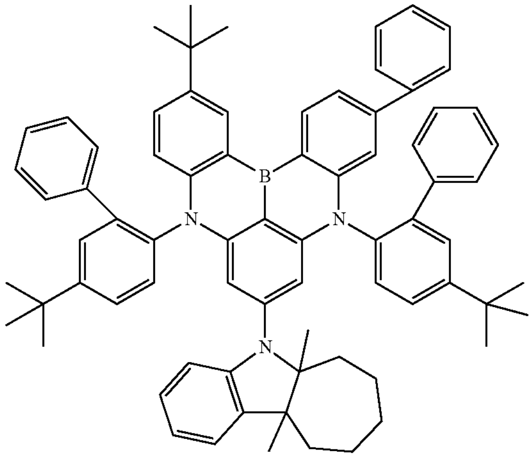
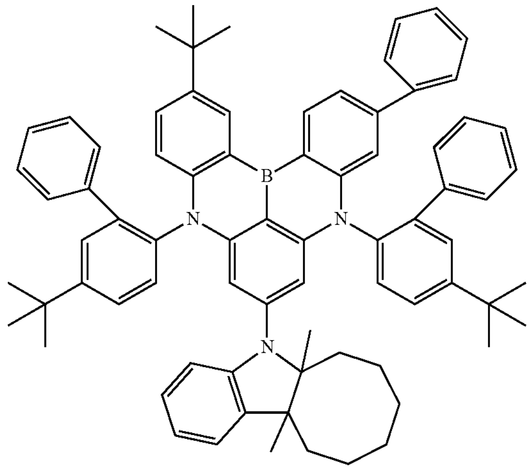
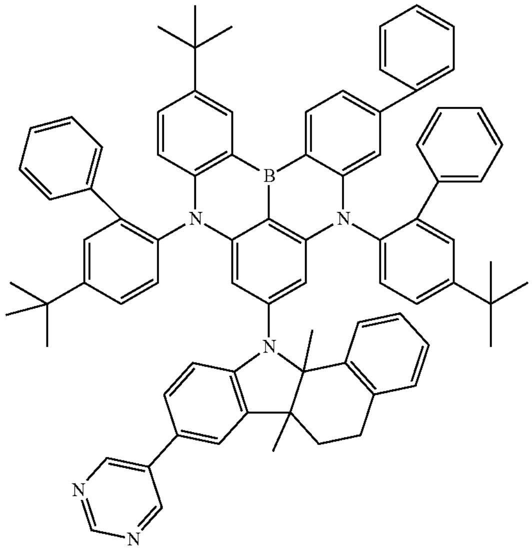

-continued
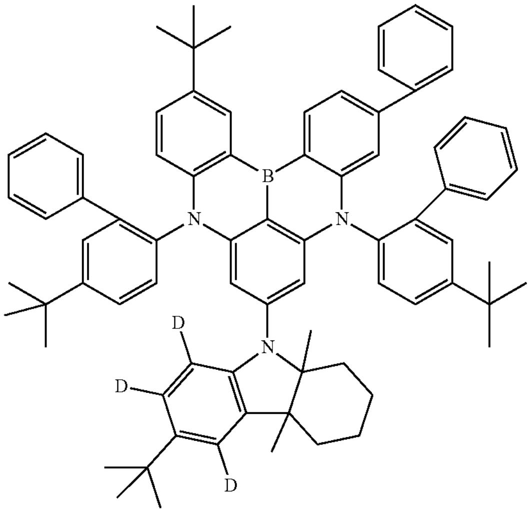
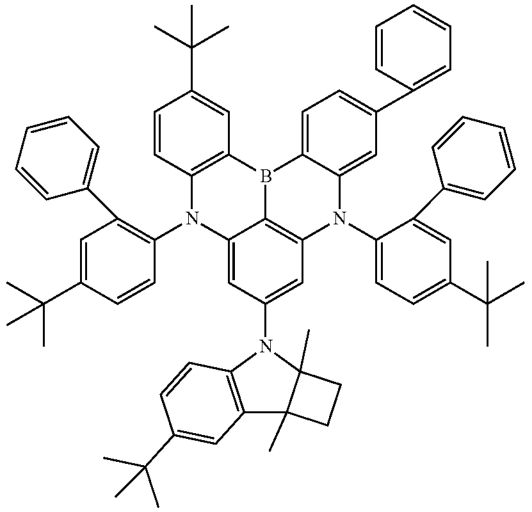
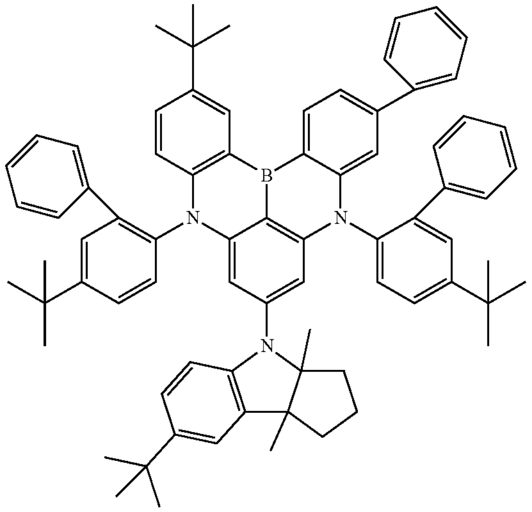
-continued
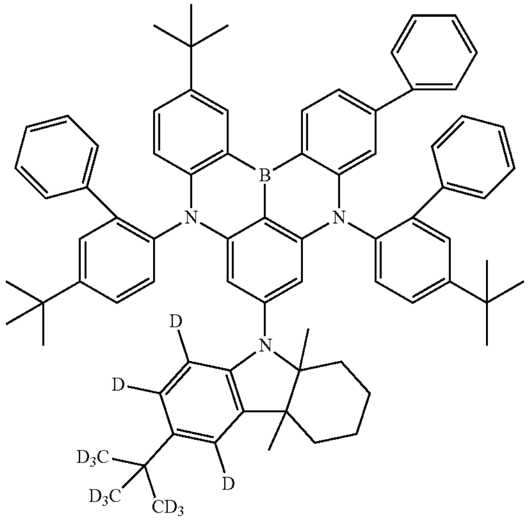
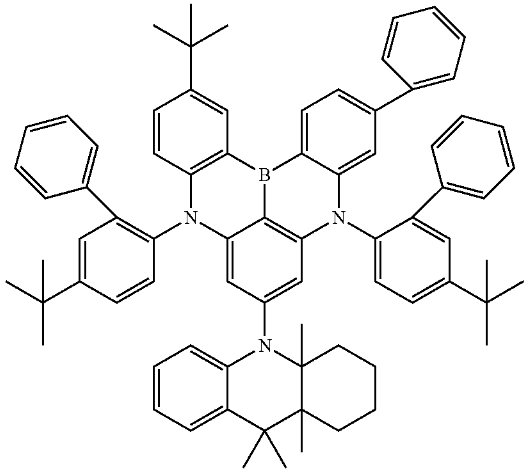
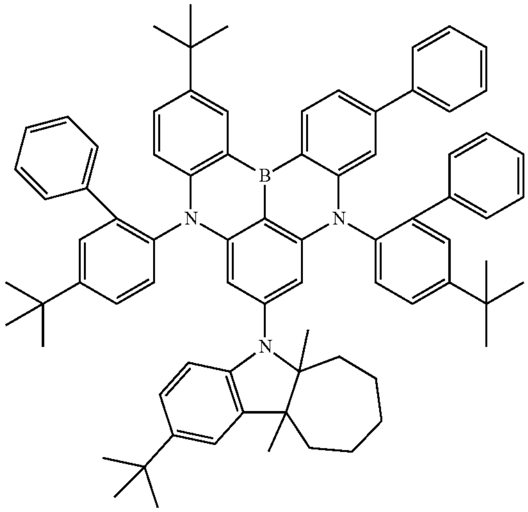

-continued
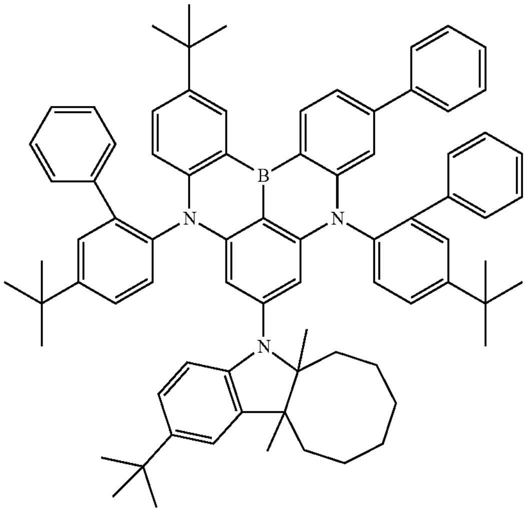
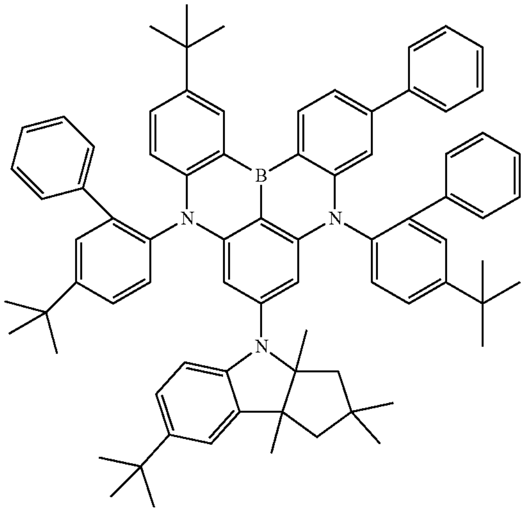
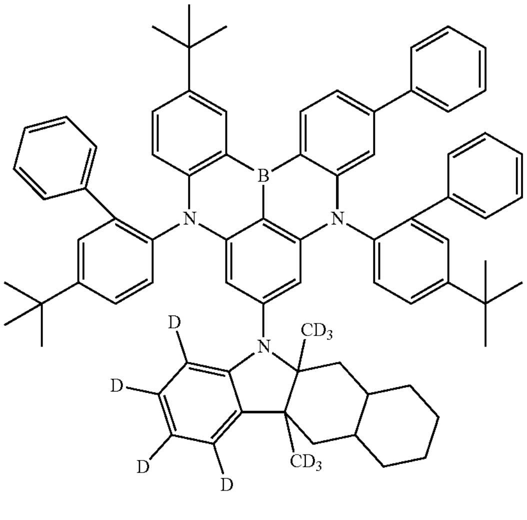
-continued
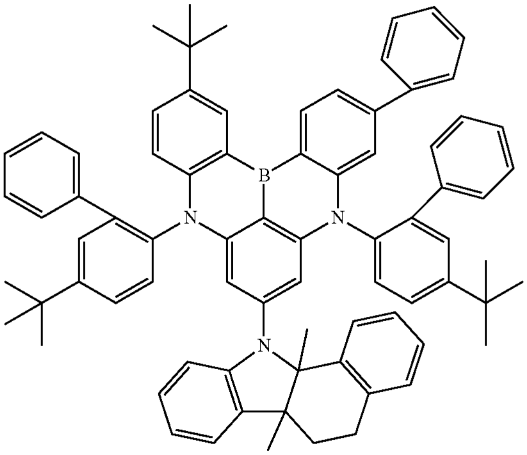
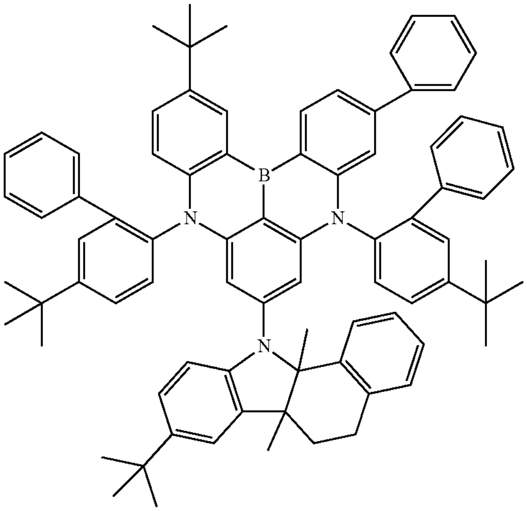
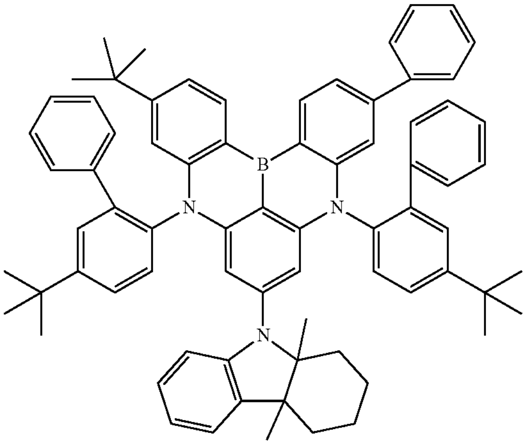

-continued
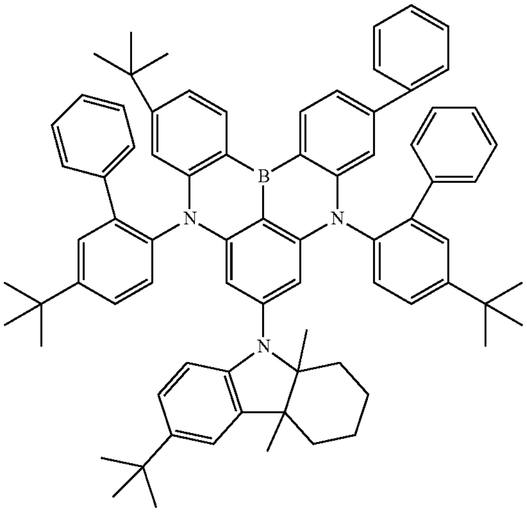
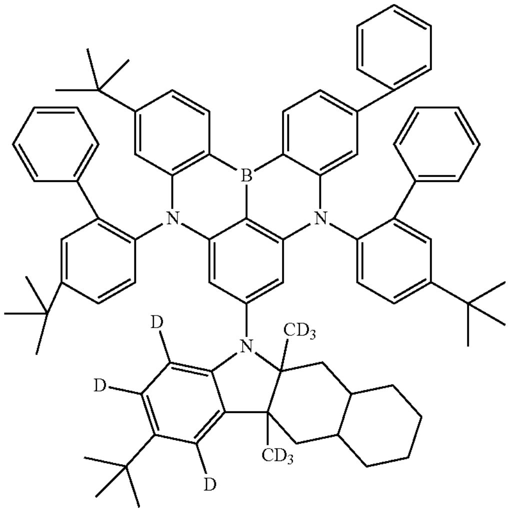
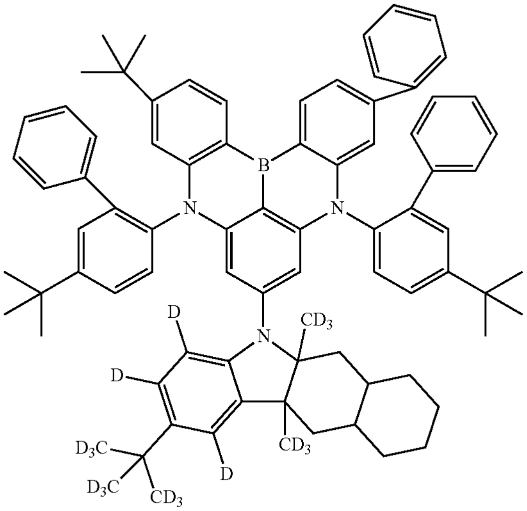
-continued
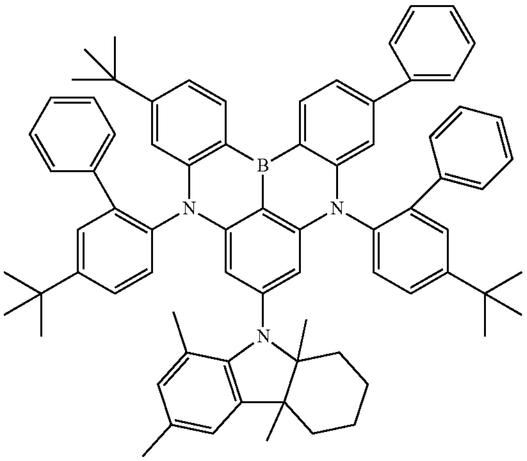
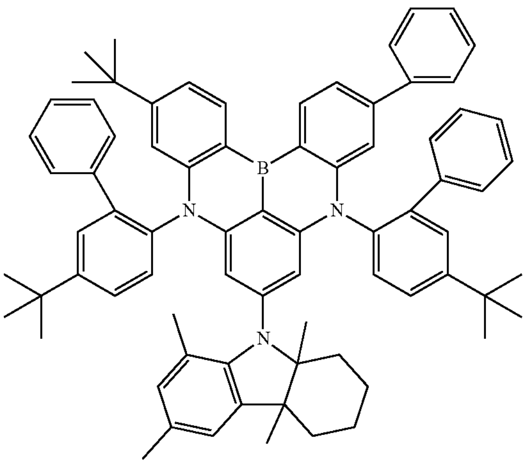
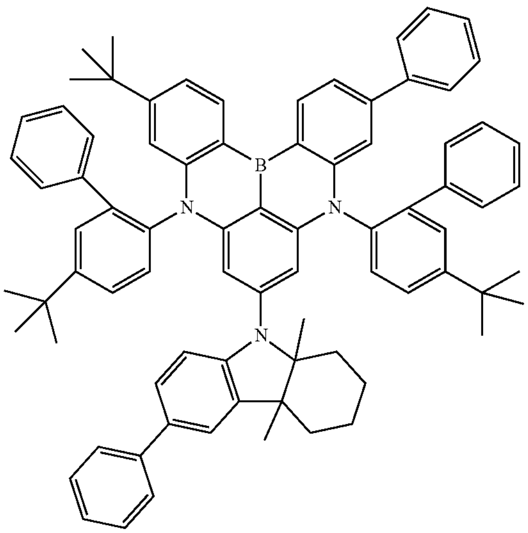

-continued
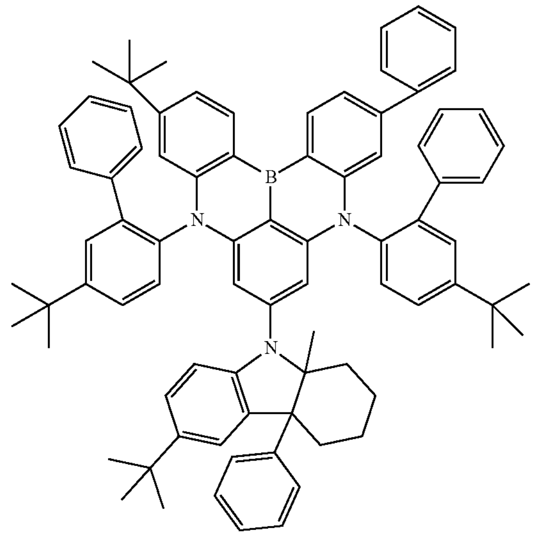
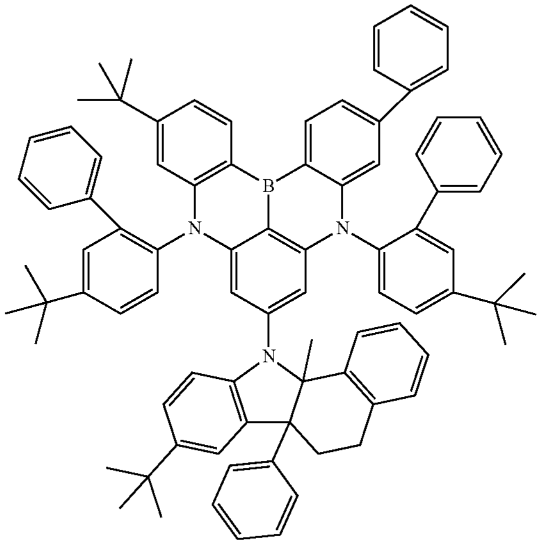
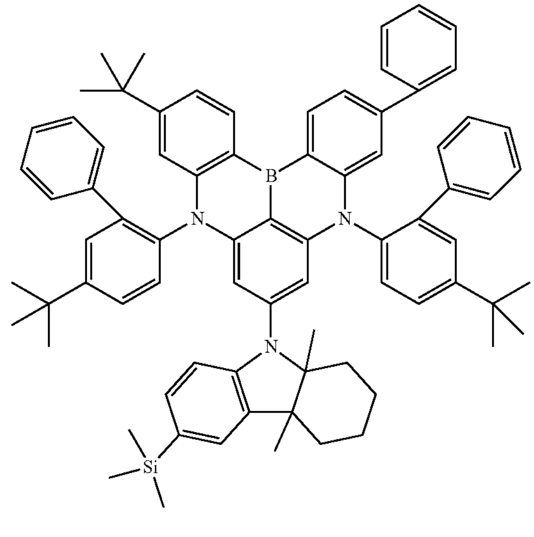
-continued
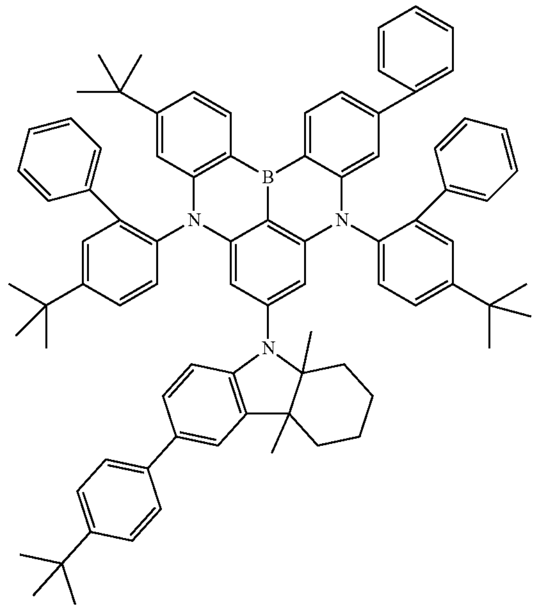
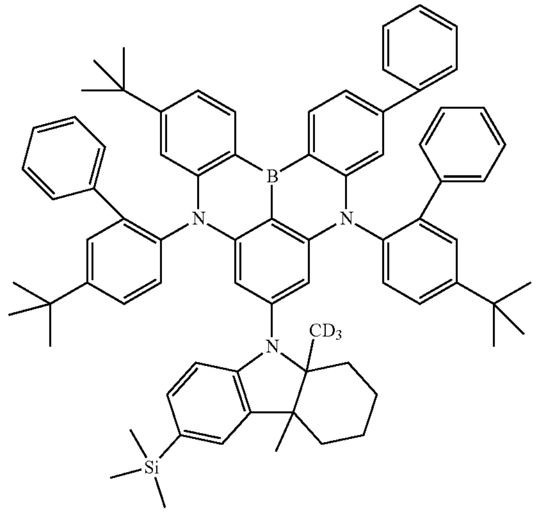
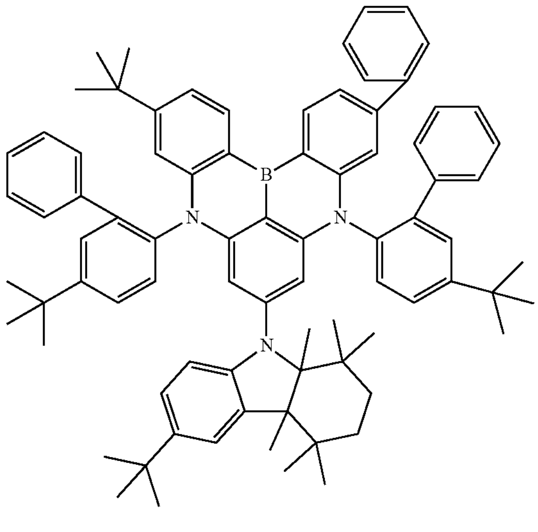

-continued
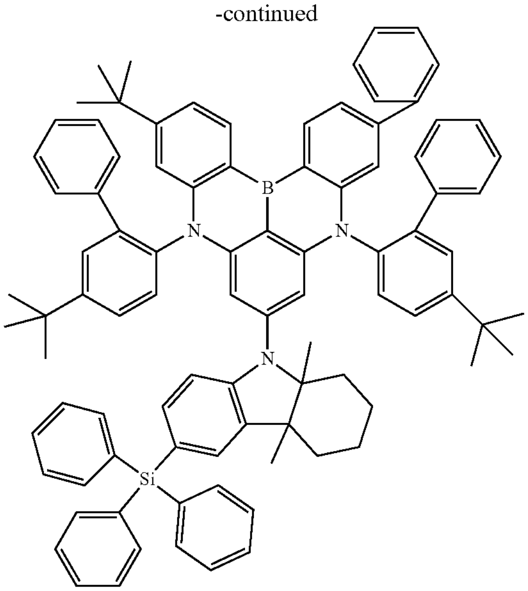
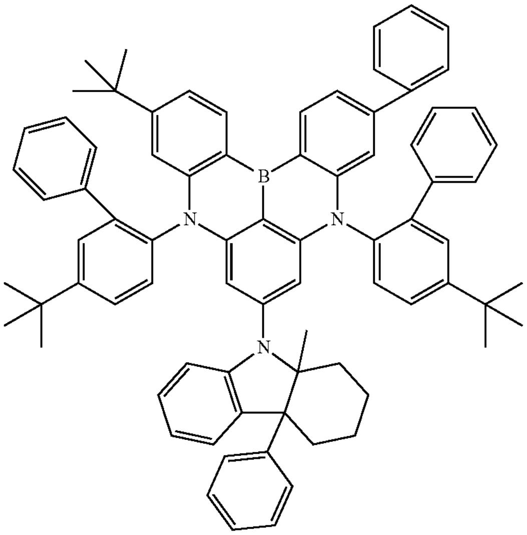
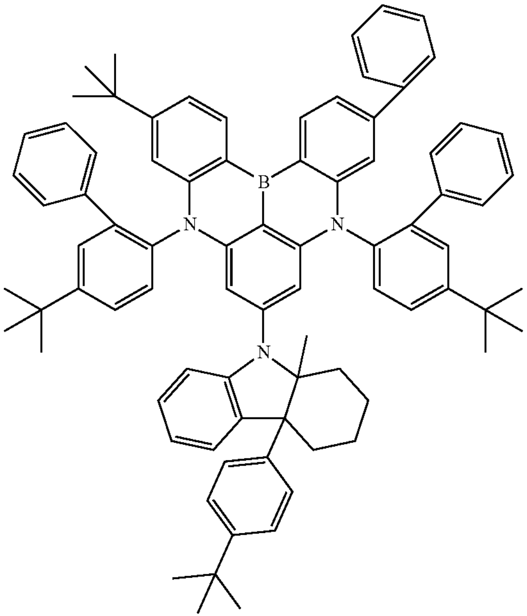
-continued
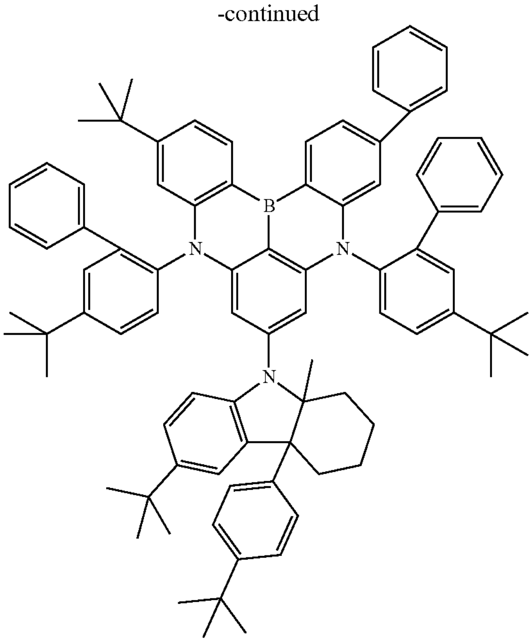
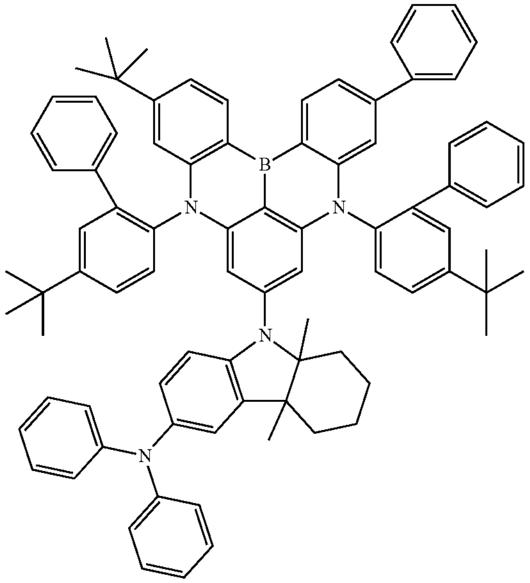
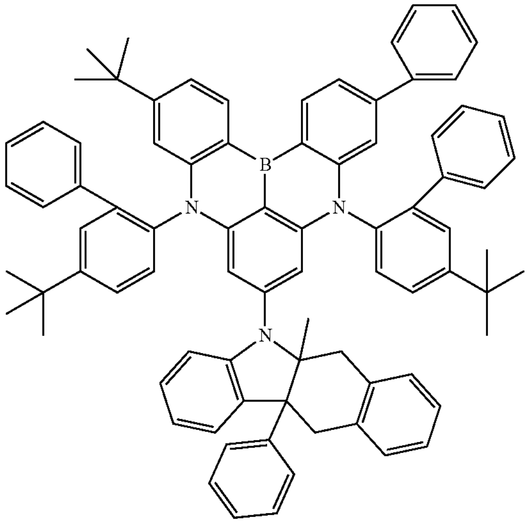

-continued
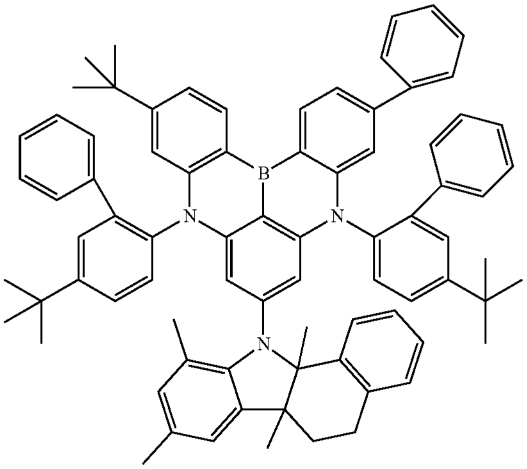
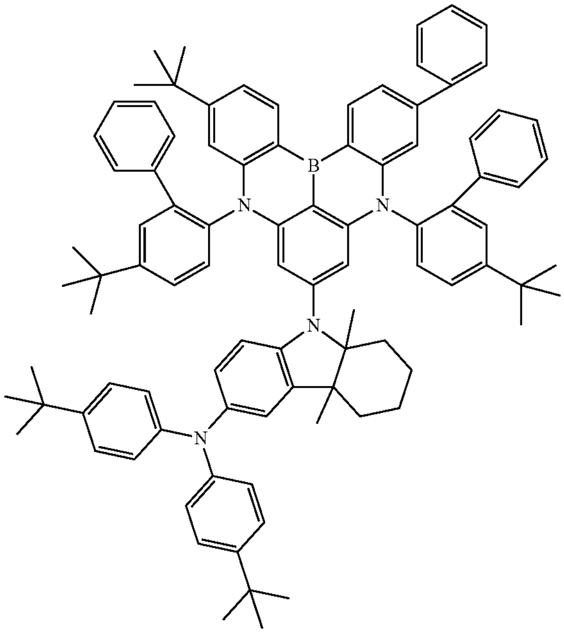
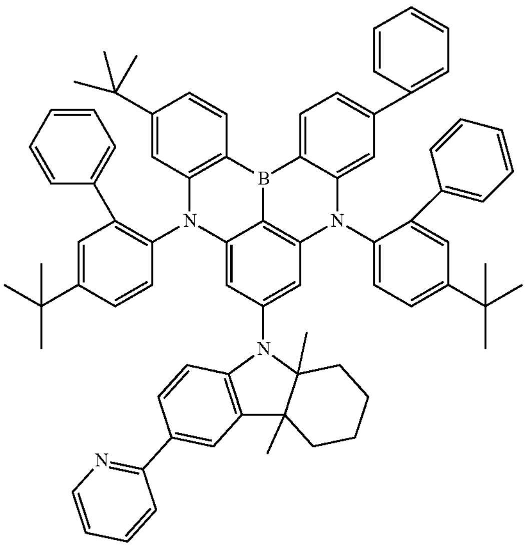
-continued
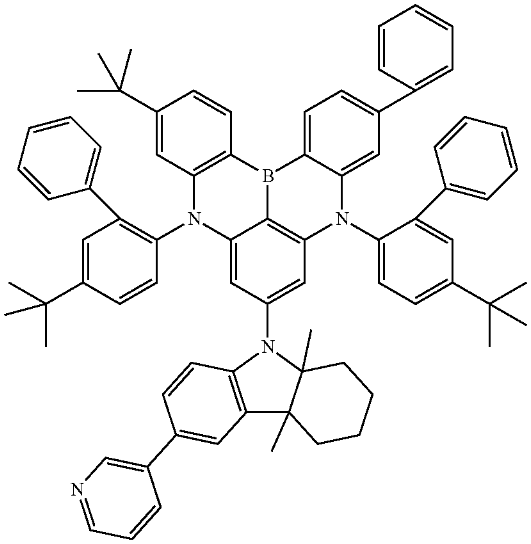
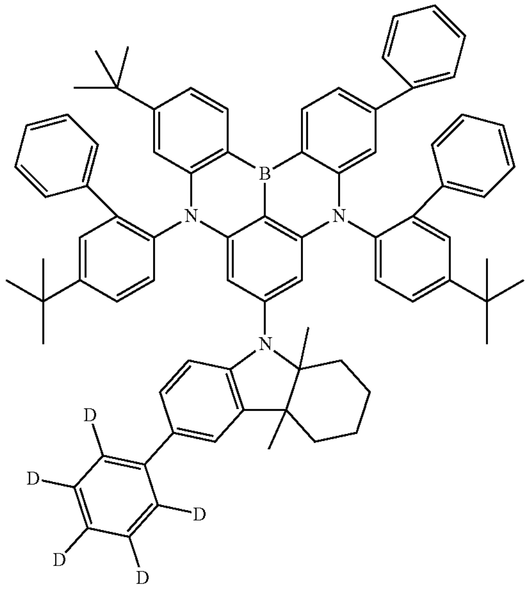
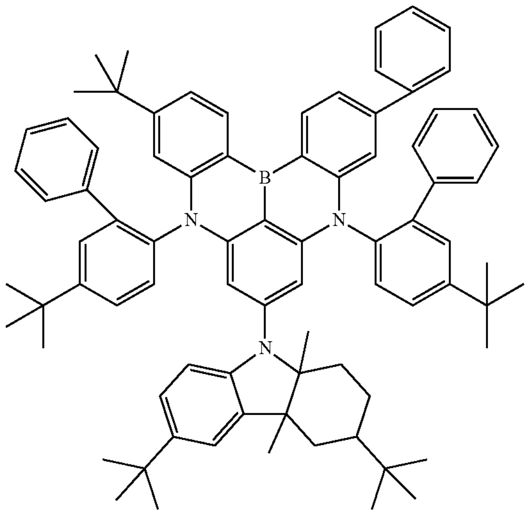

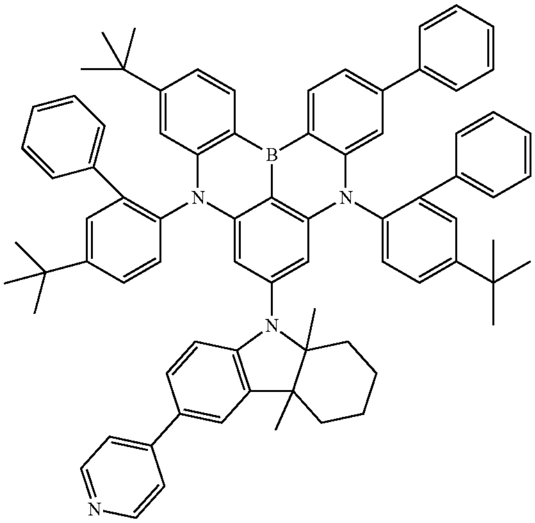
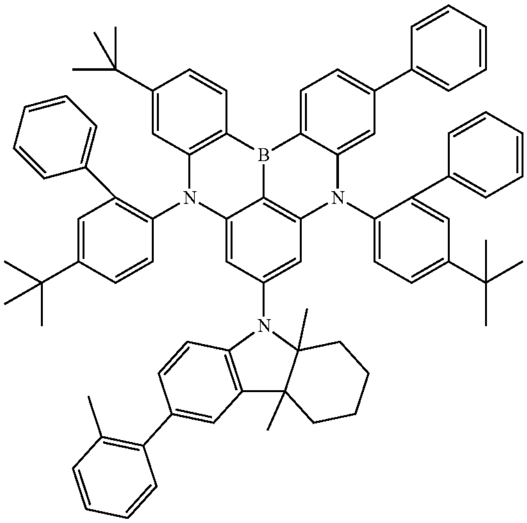
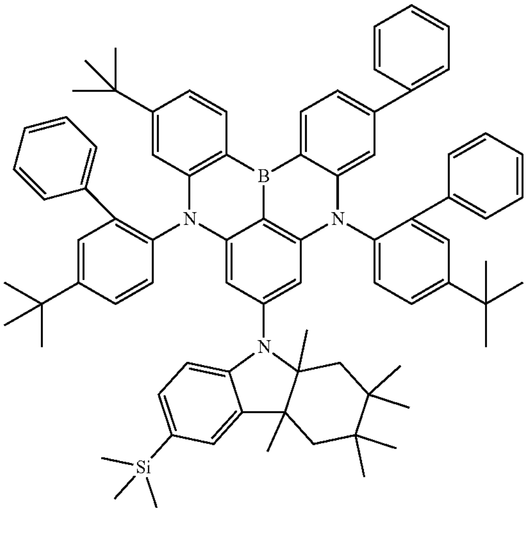
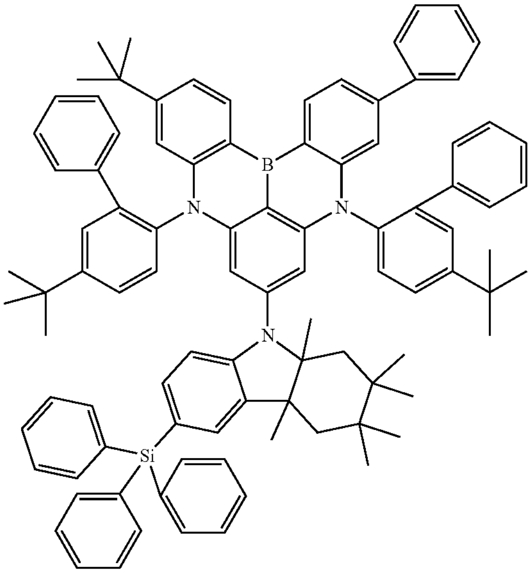
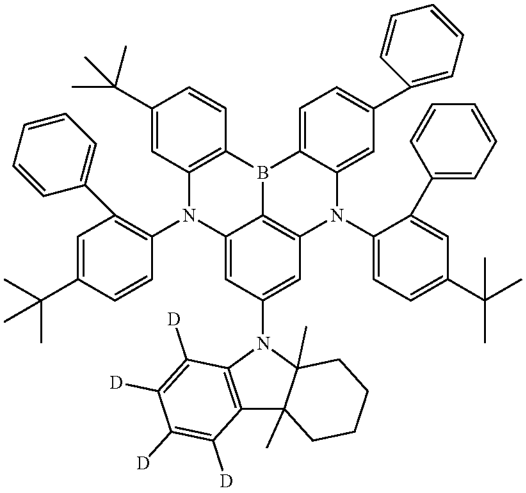
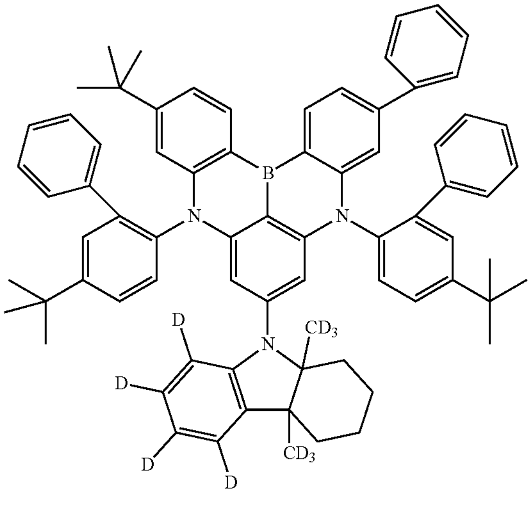

-continued
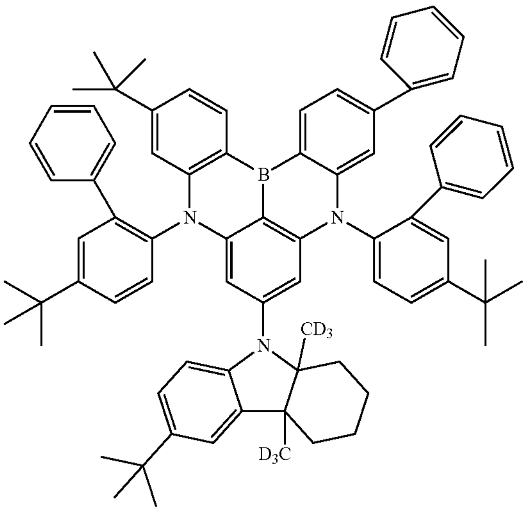
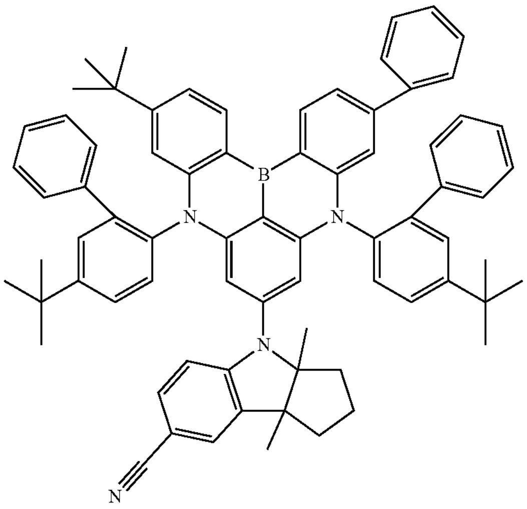
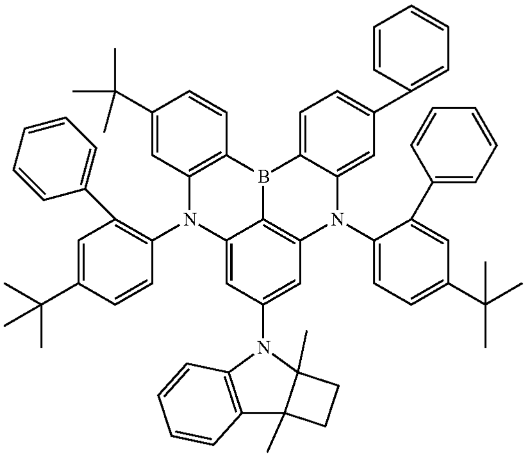
-continued
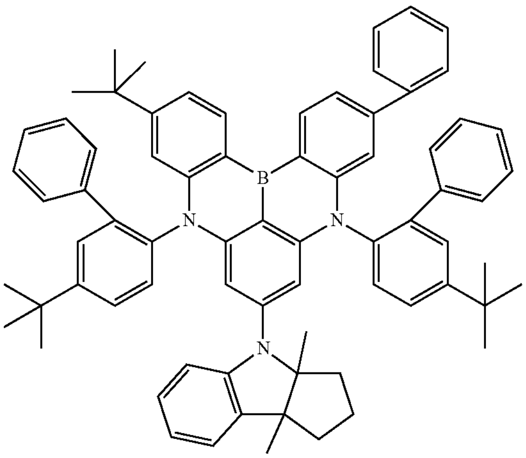
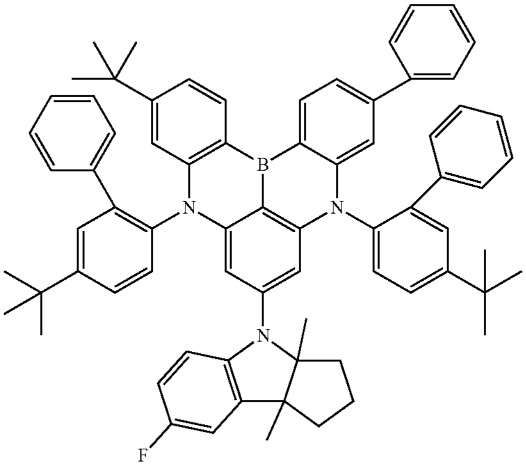
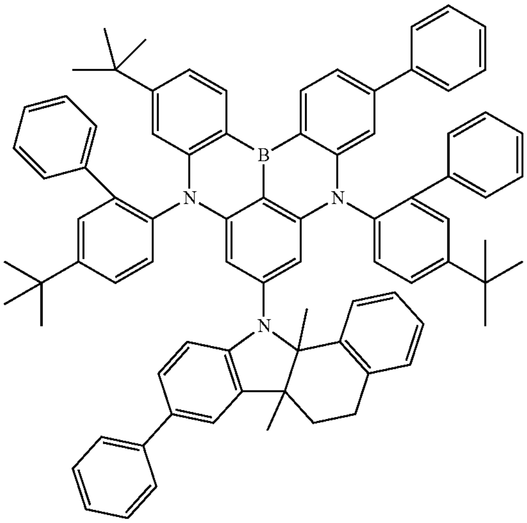

-continued
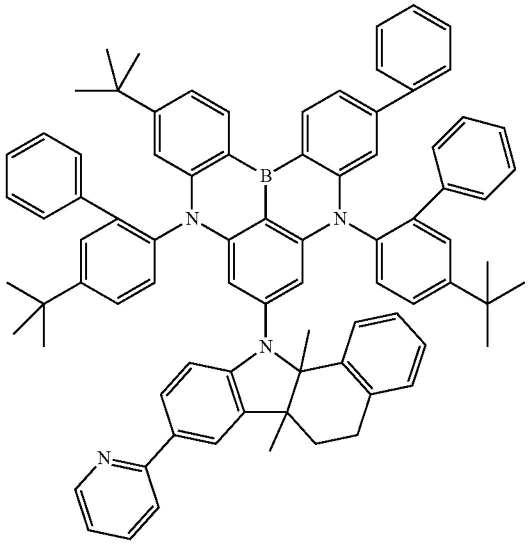
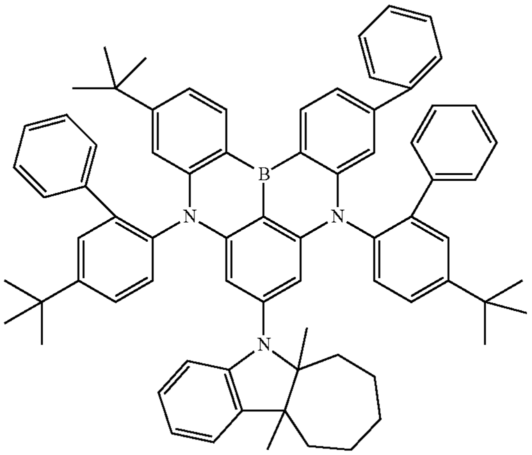
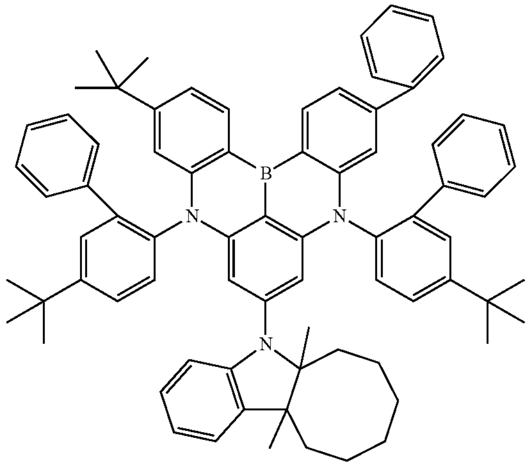
-continued
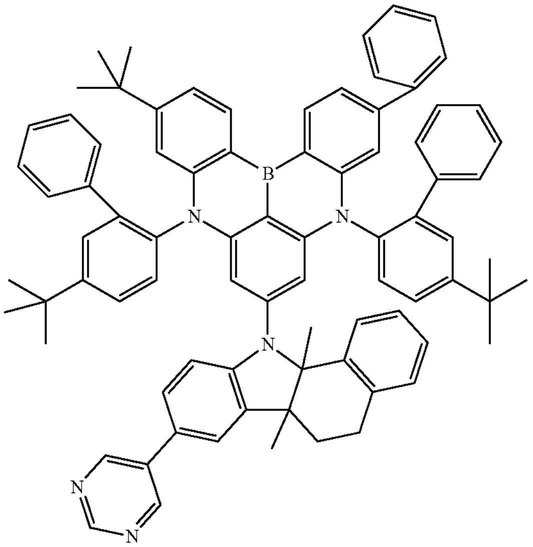
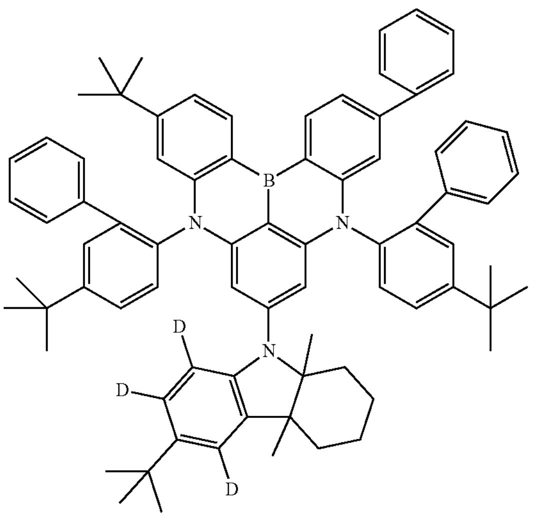
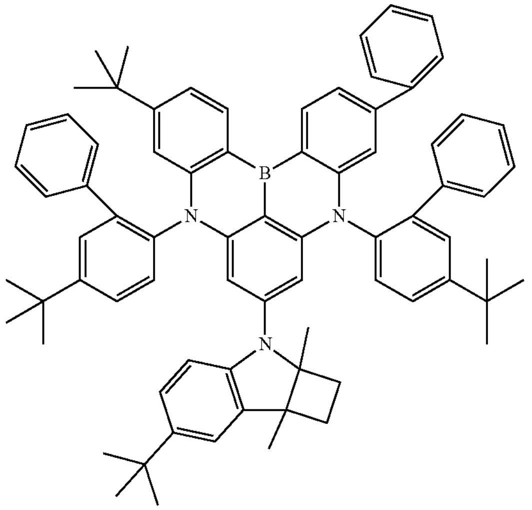

-continued
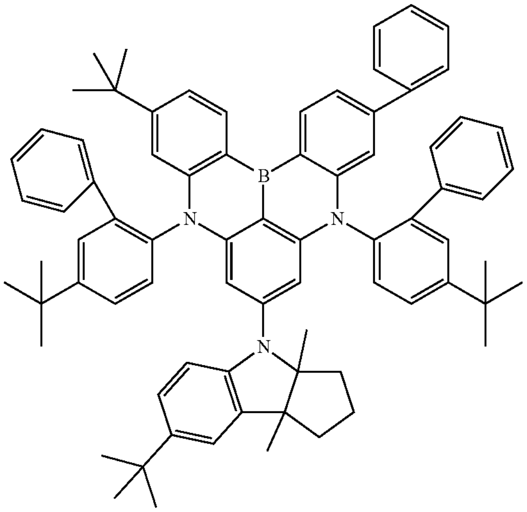
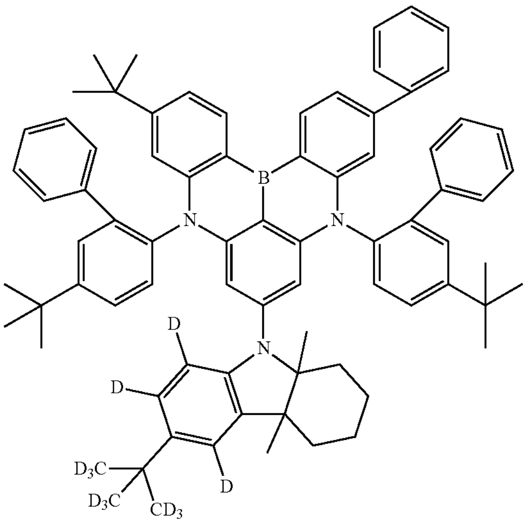
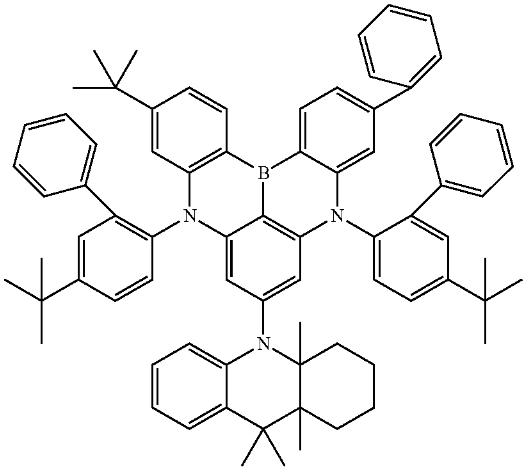
-continued
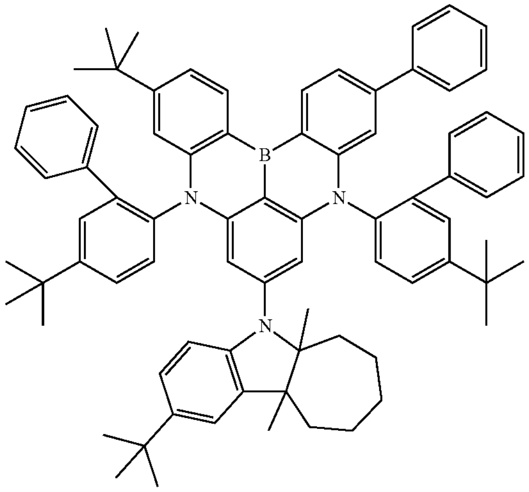
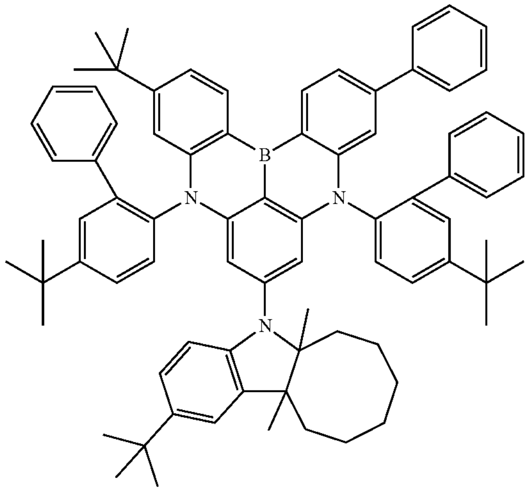
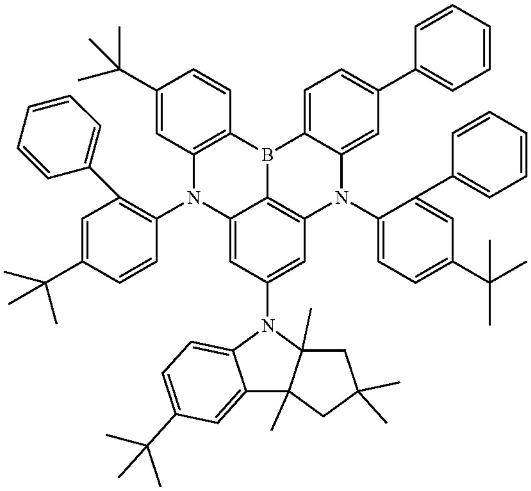

-continued
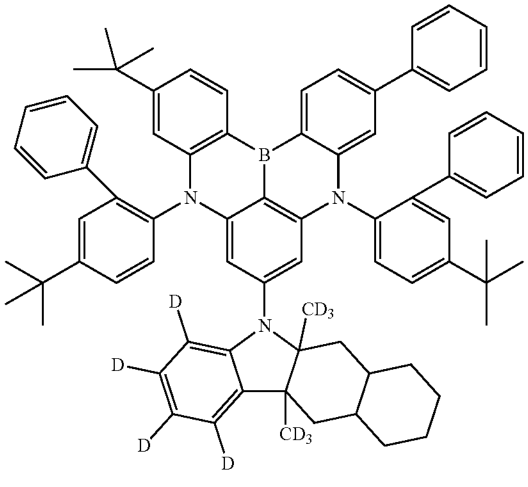
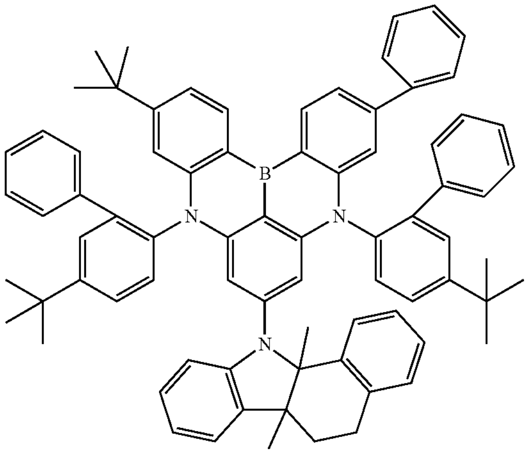
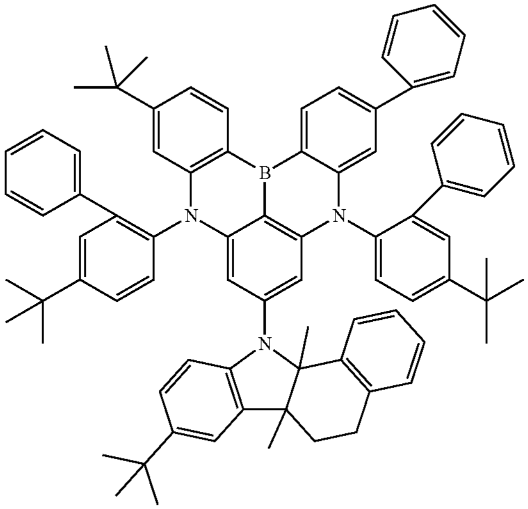
-continued
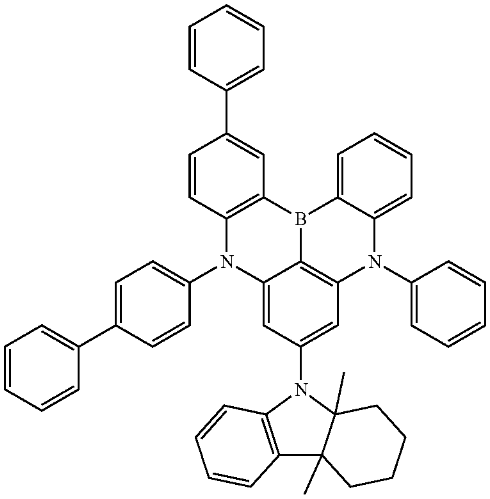
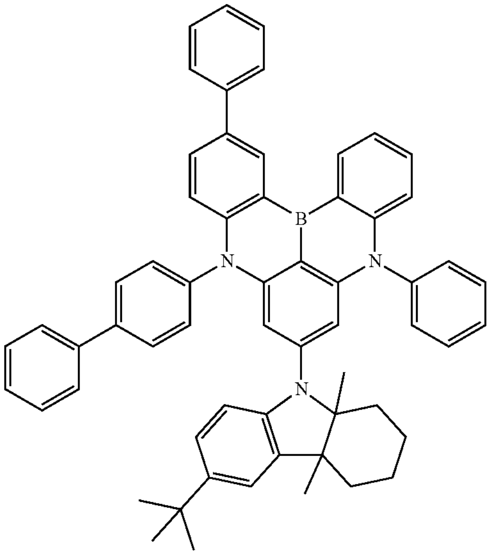
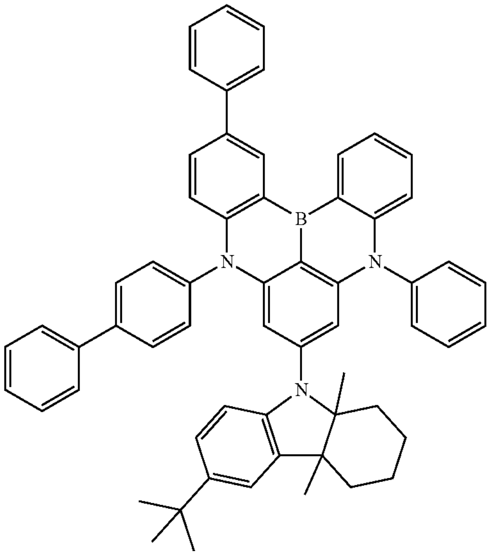

-continued
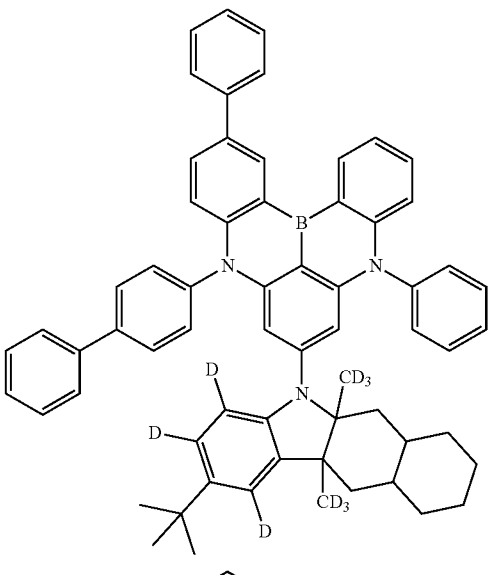
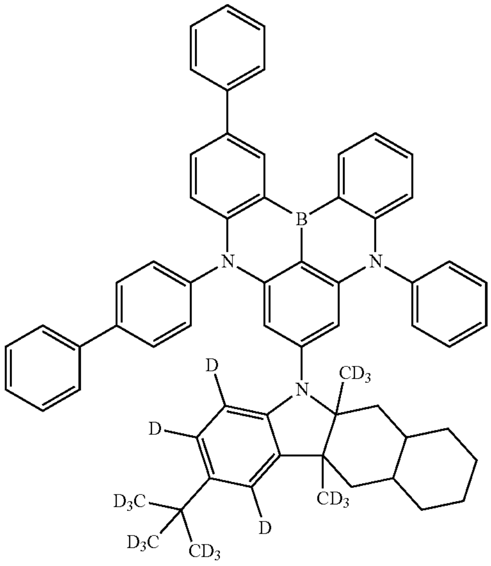
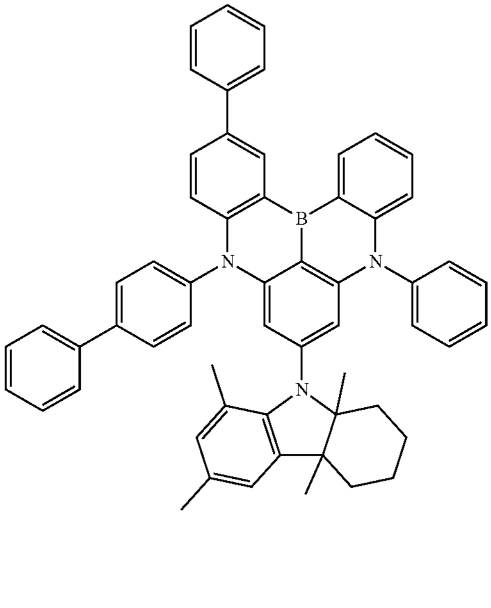
-continued
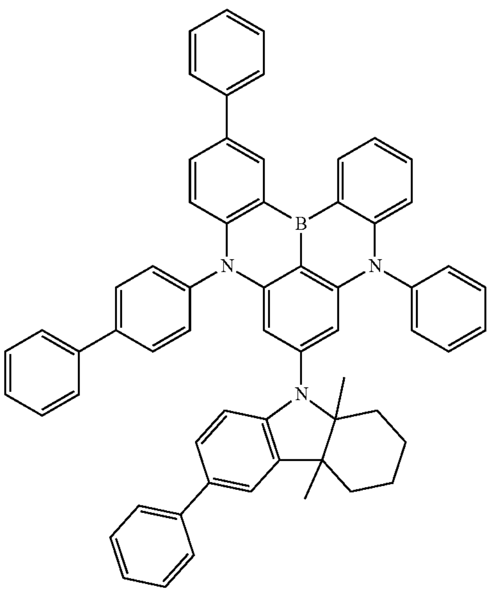
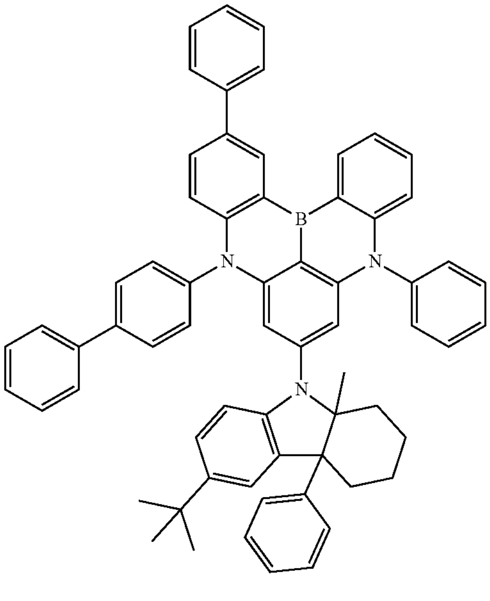

-continued
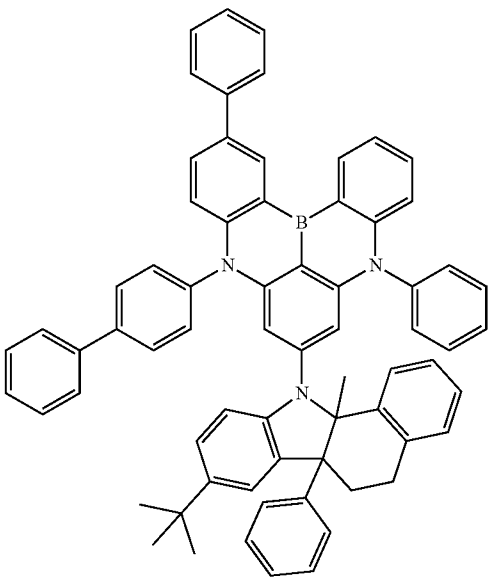
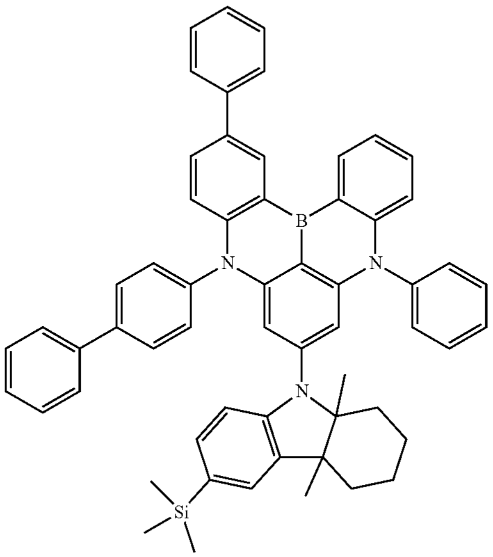
-continued
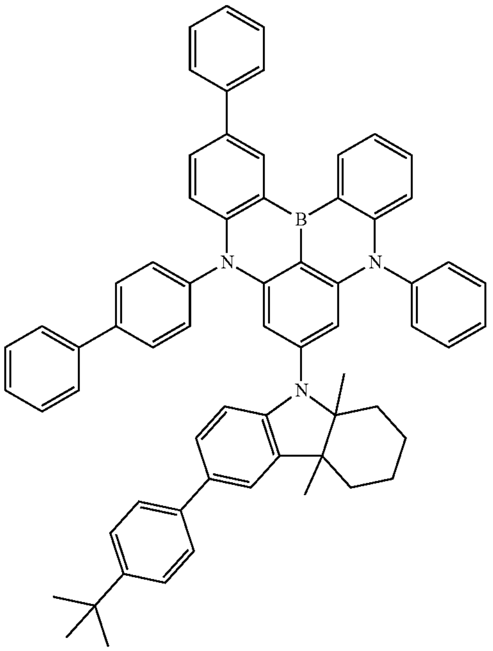
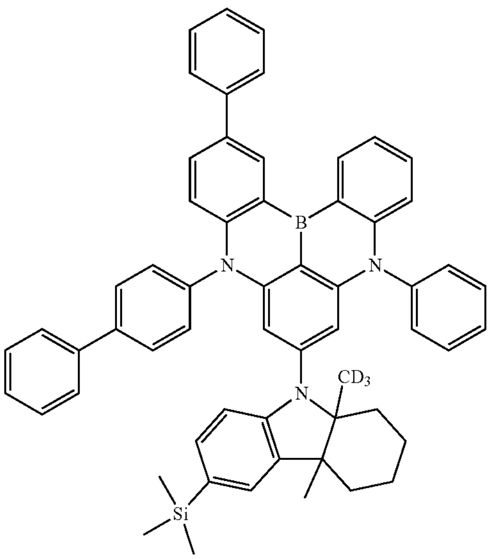

-continued
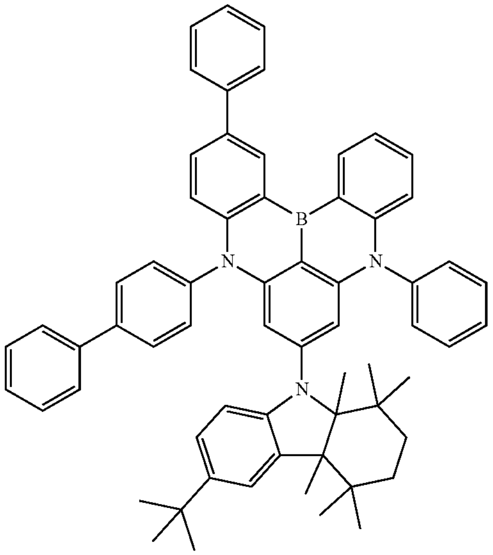
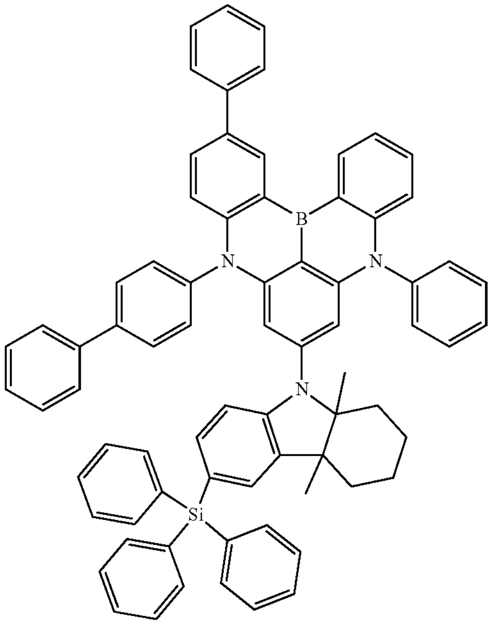
-continued
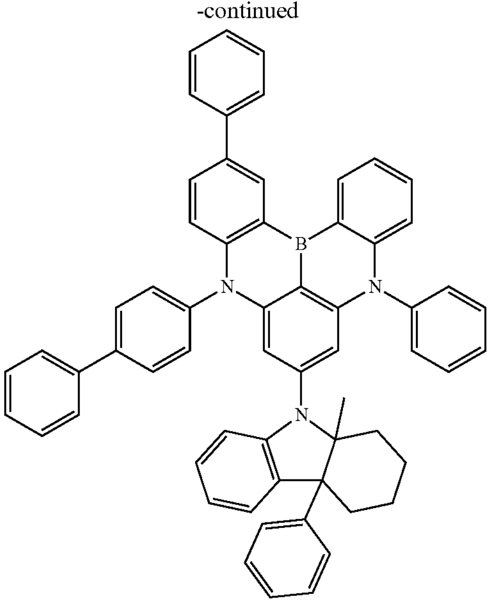
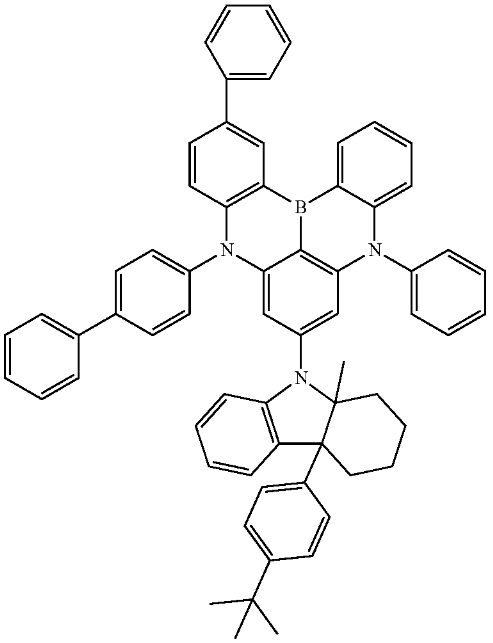

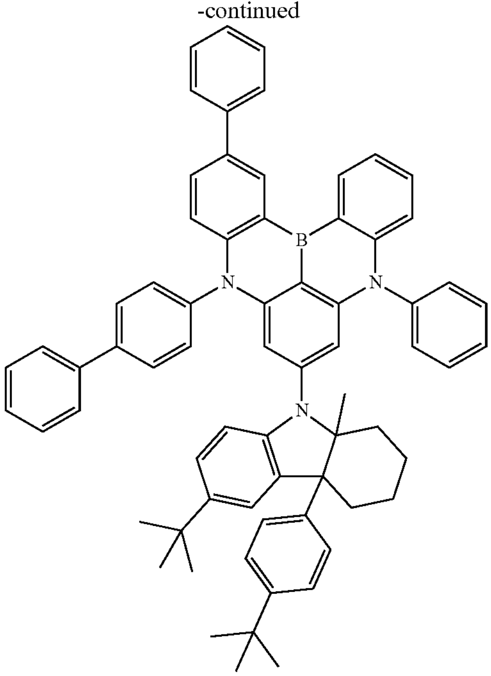
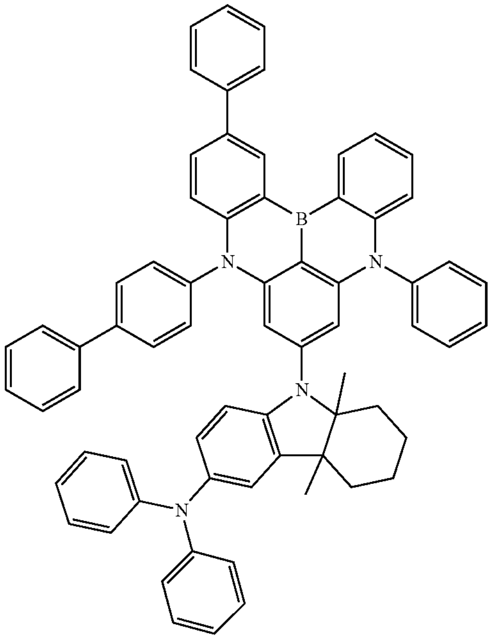
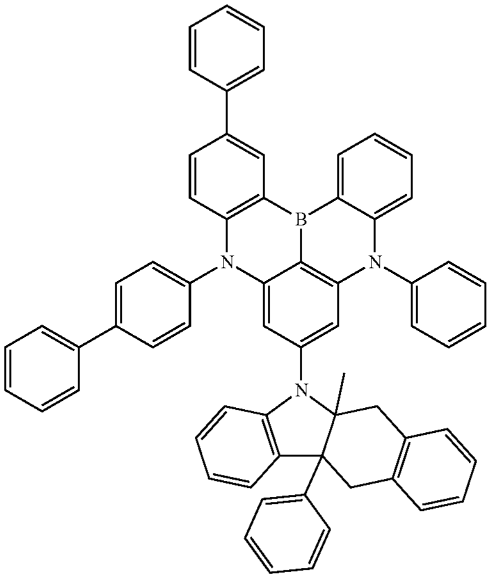
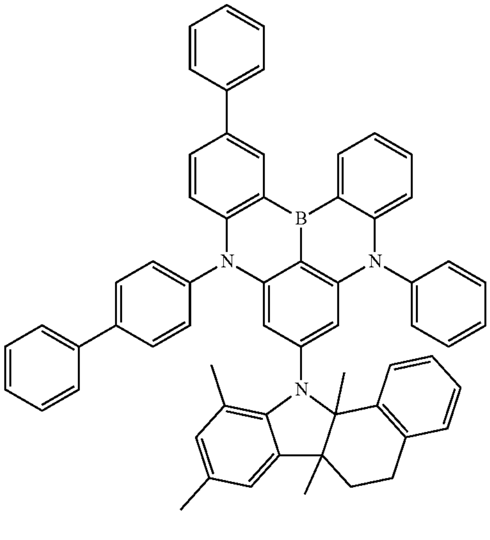

-continued
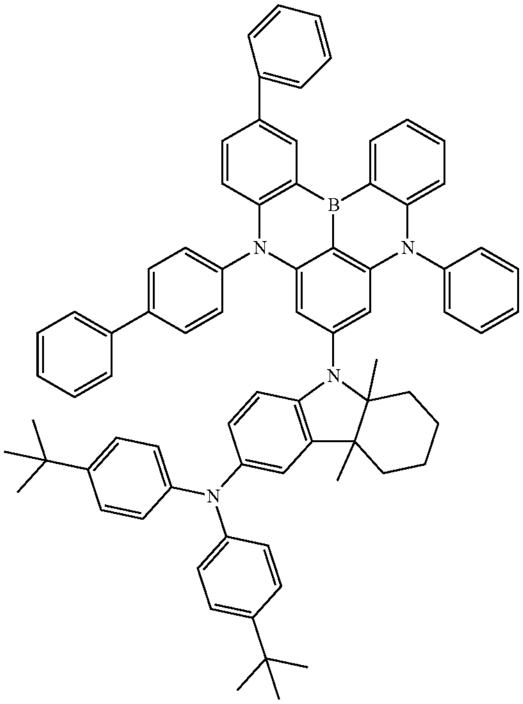
-continued
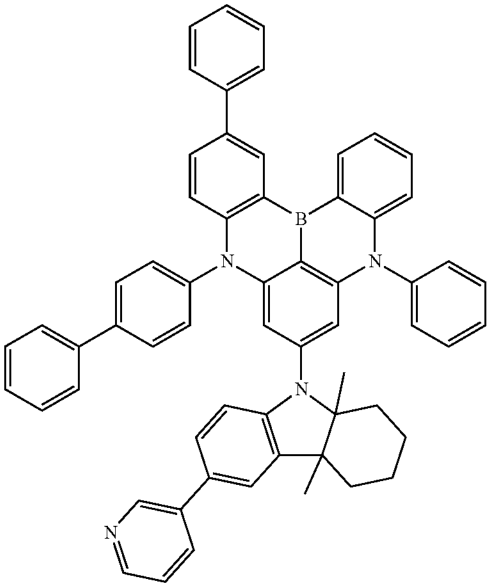
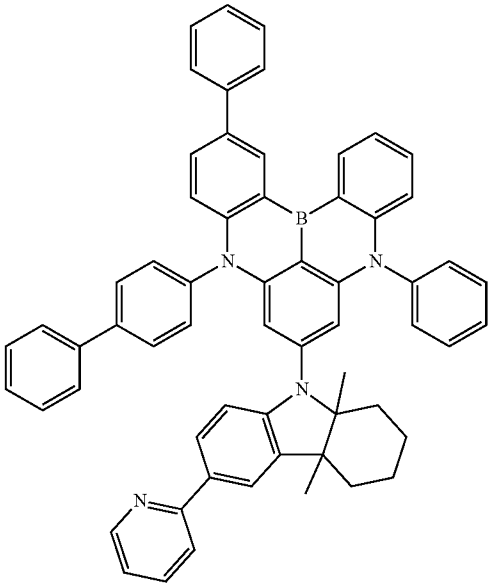
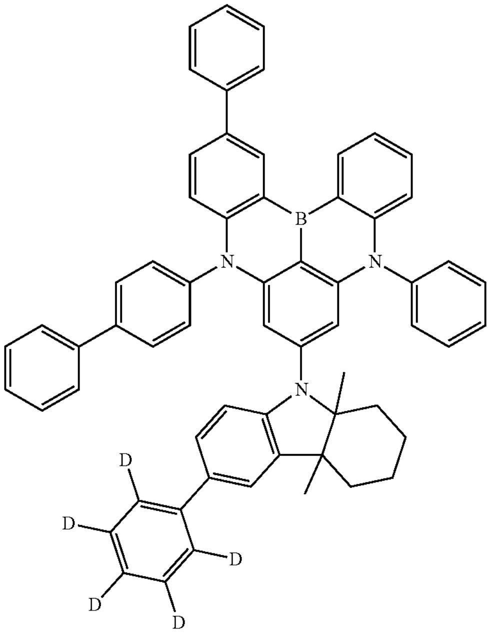

-continued
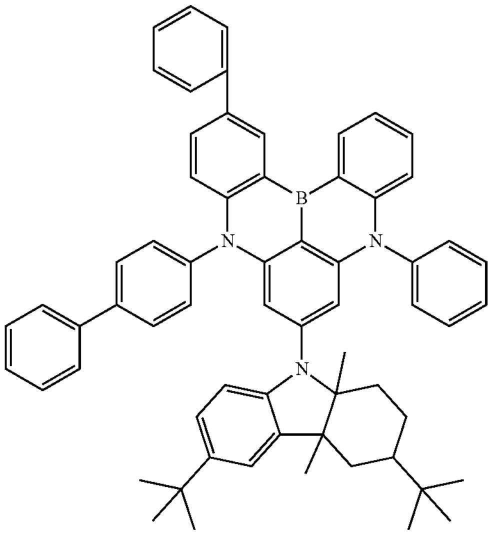
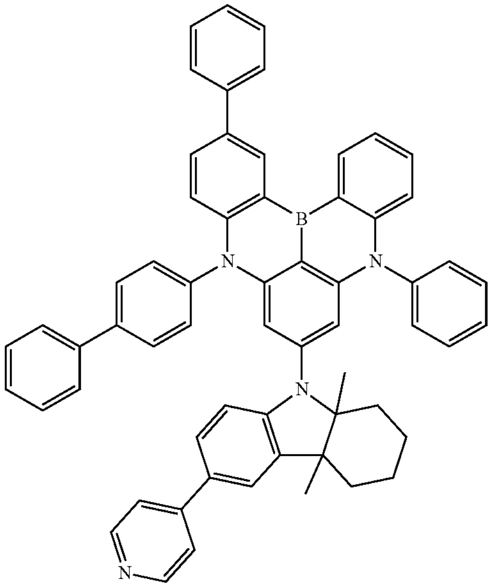
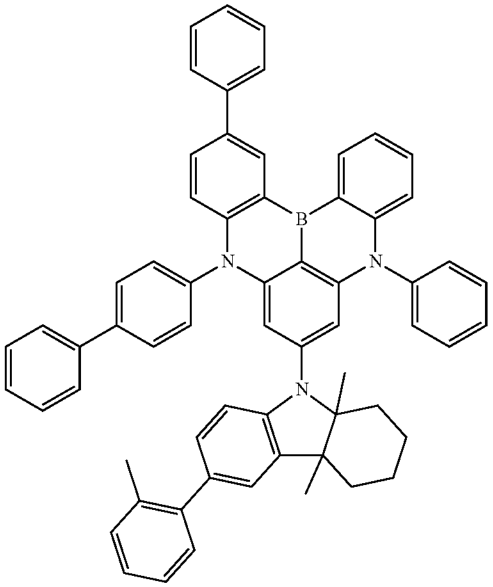
-continued
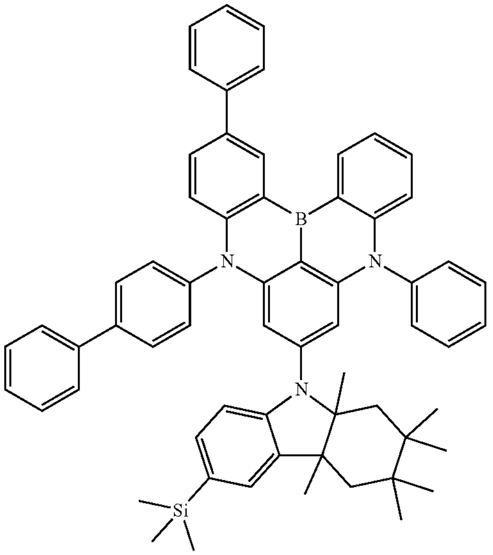
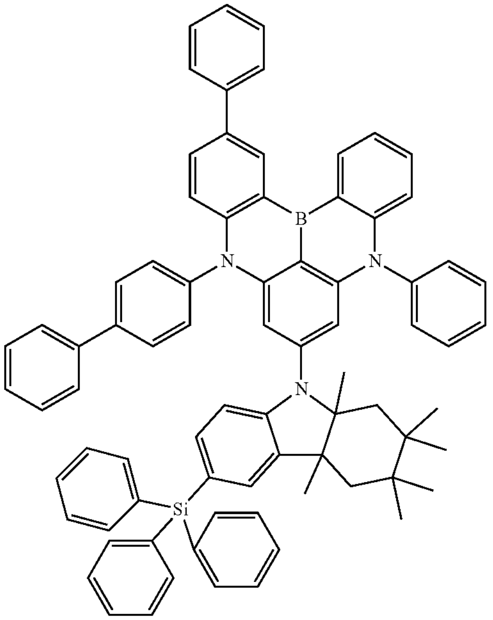
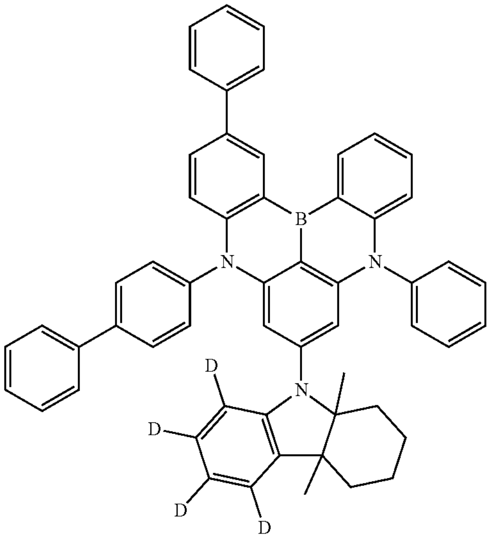

-continued
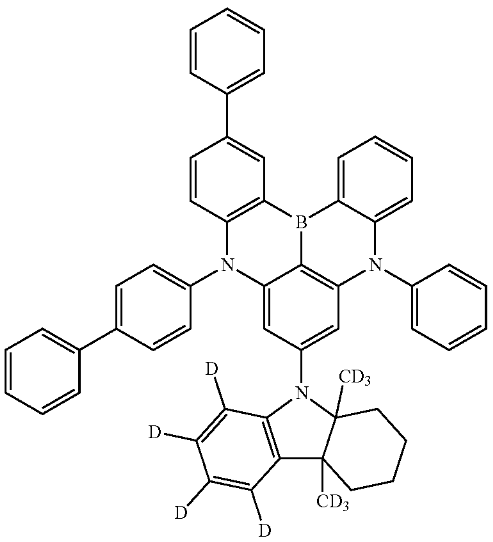
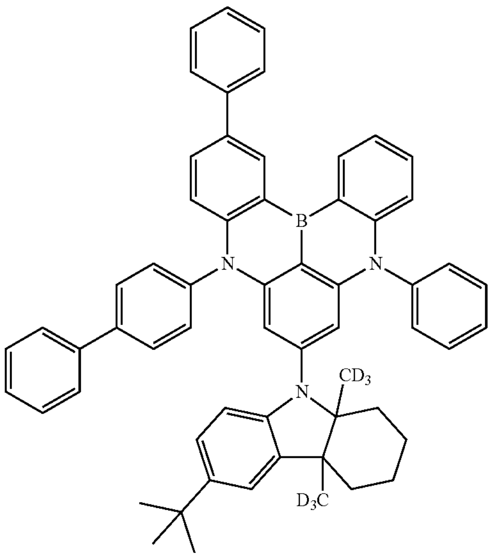
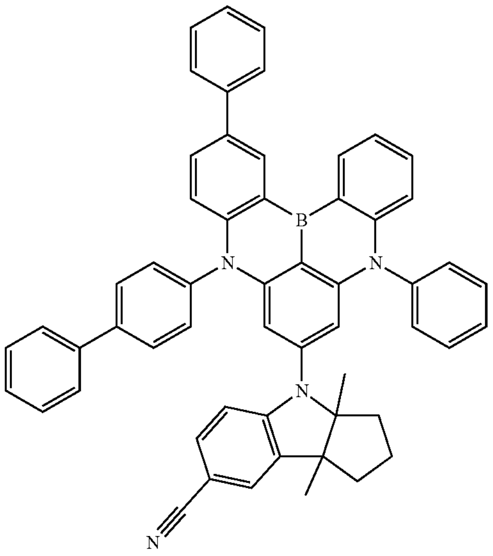
-continued
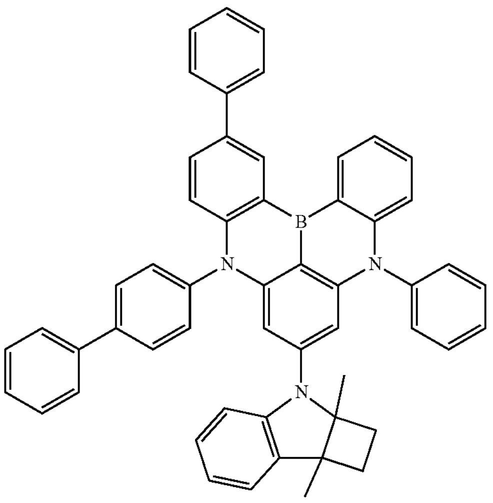
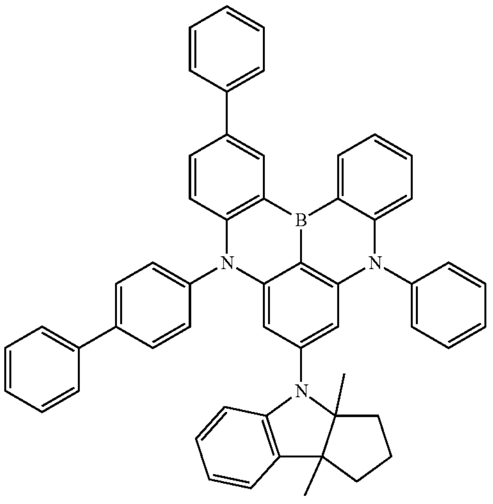
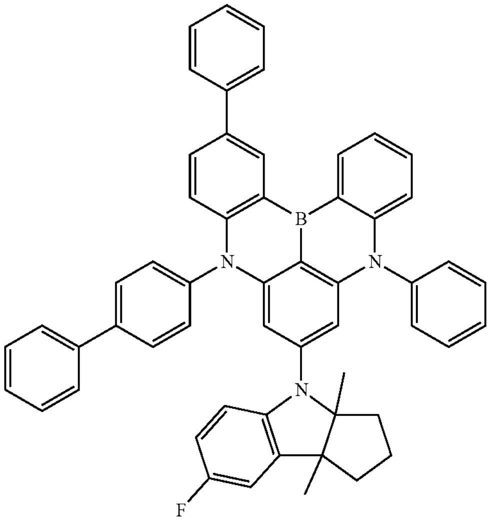

-continued
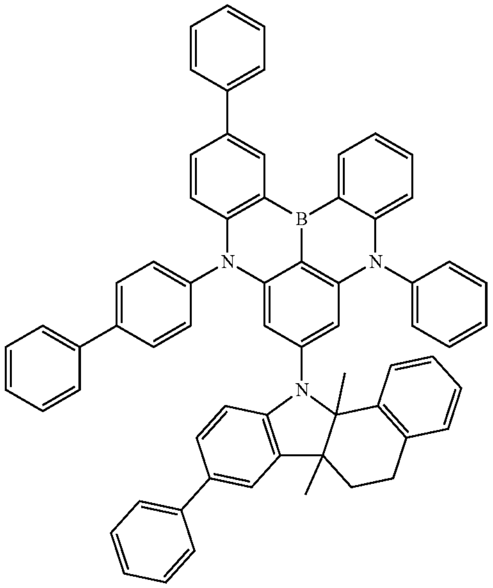
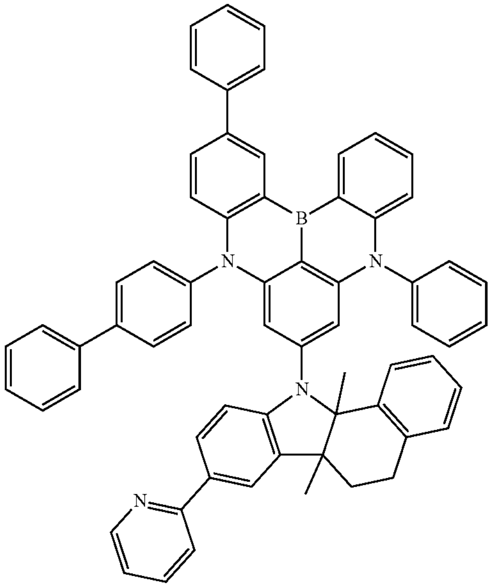
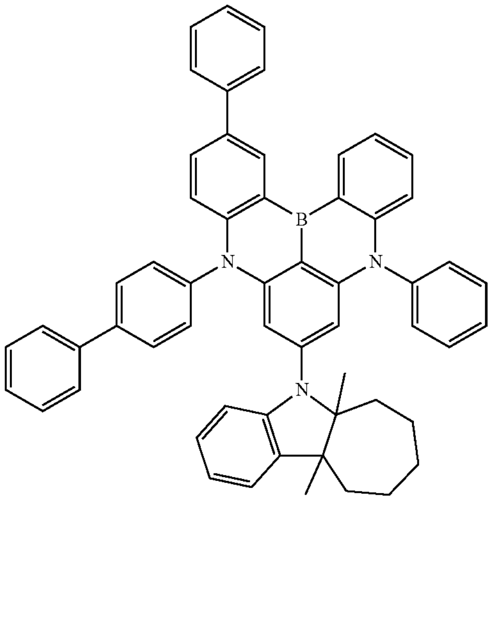
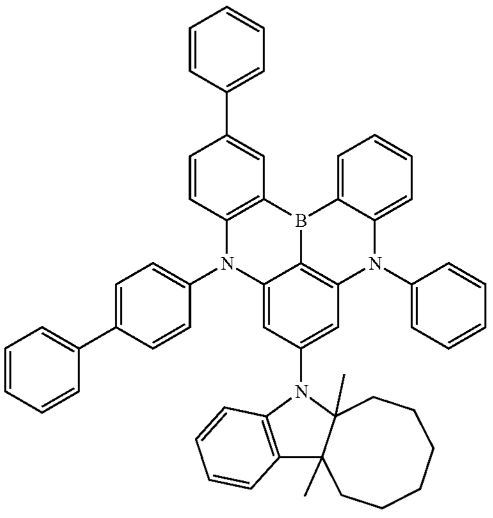
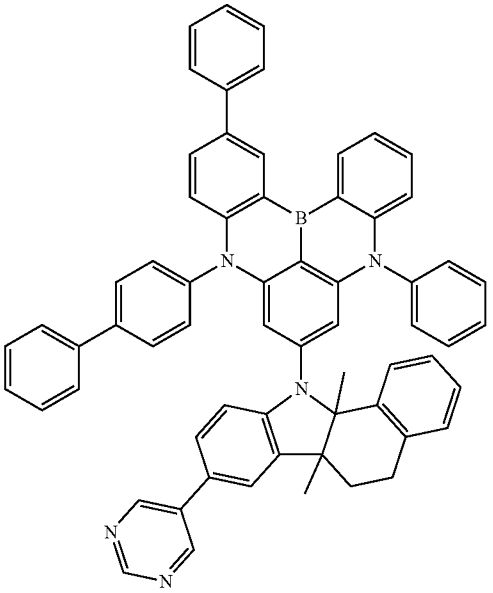
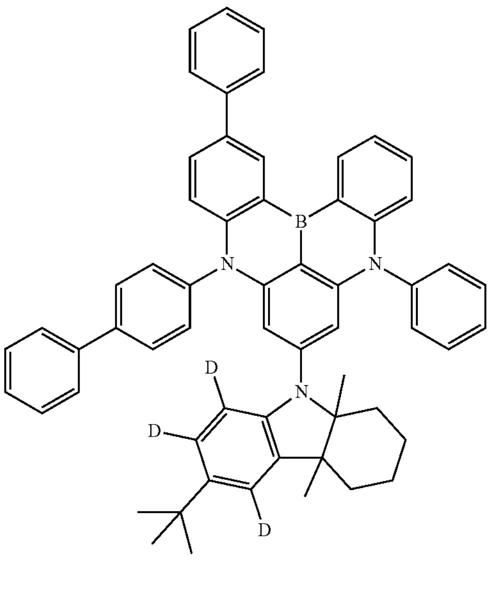

-continued
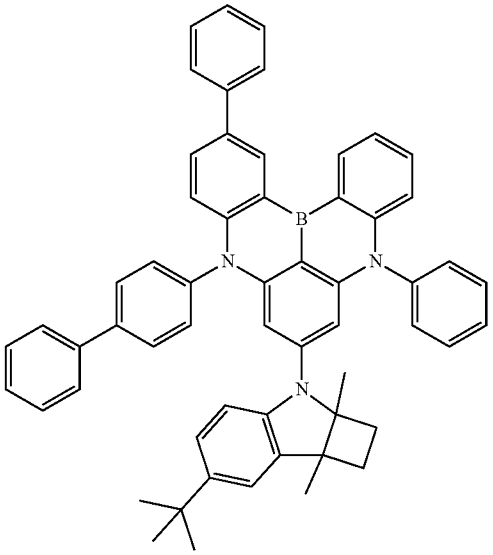
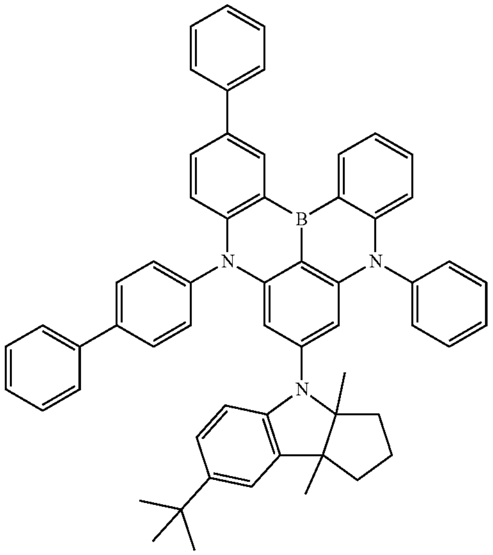
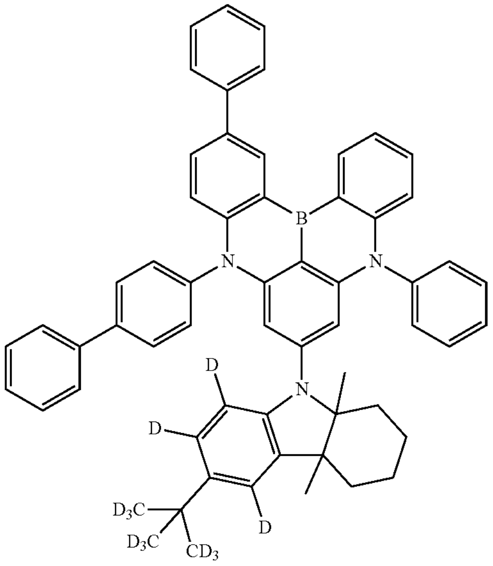
-continued
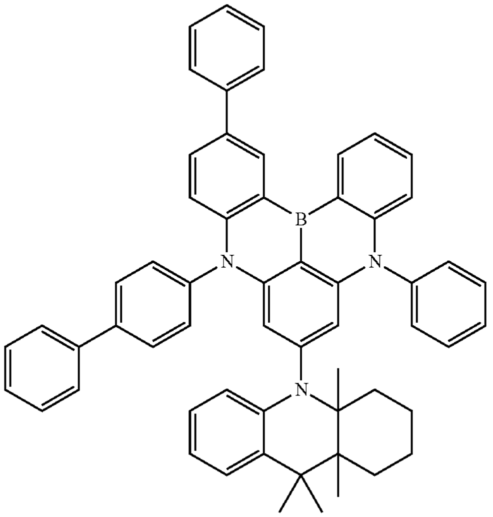
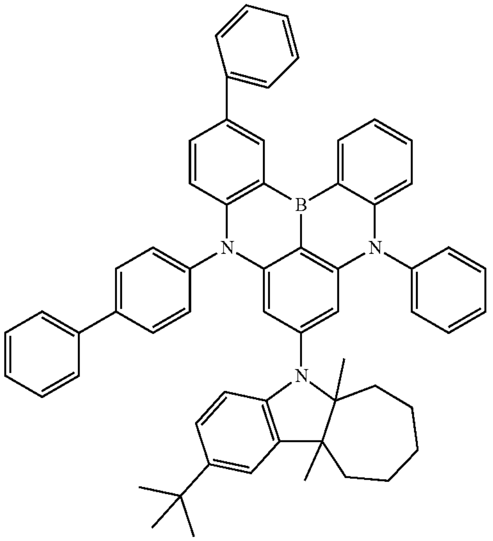
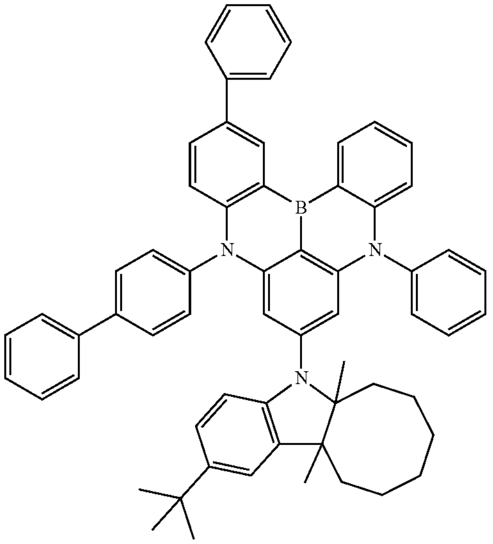

-continued
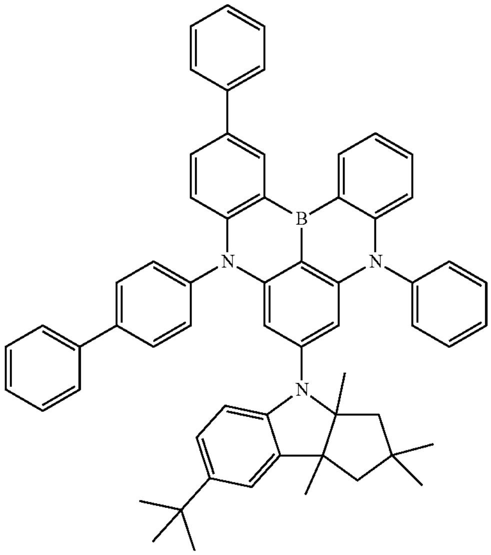
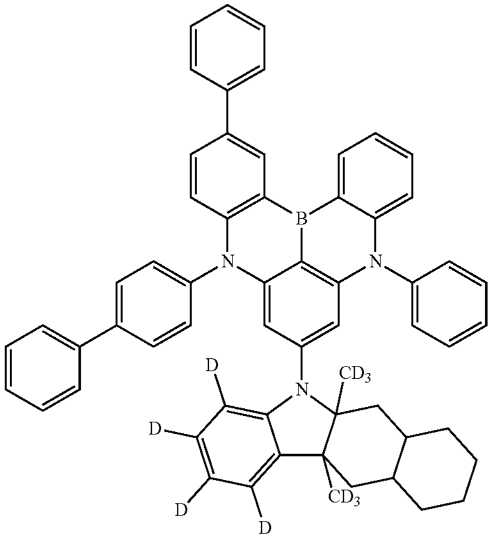
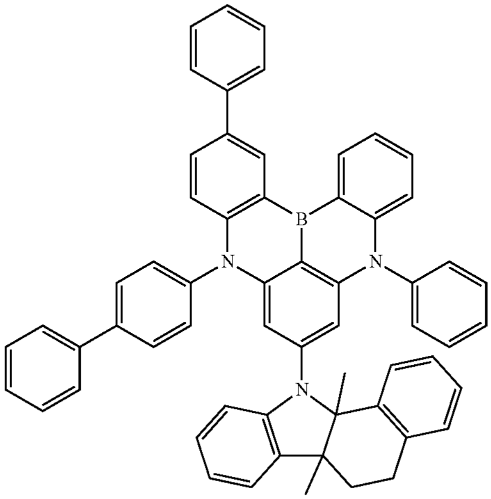
-continued
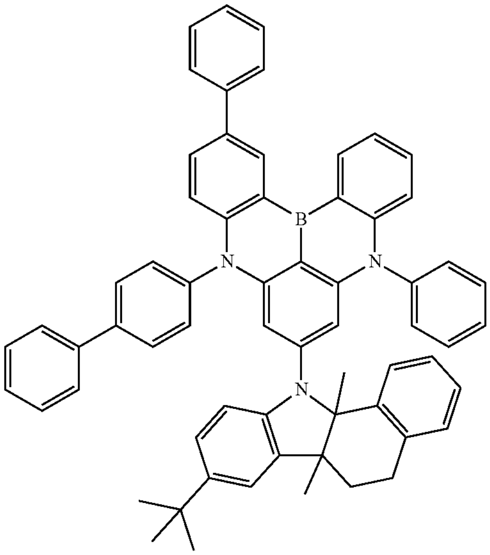
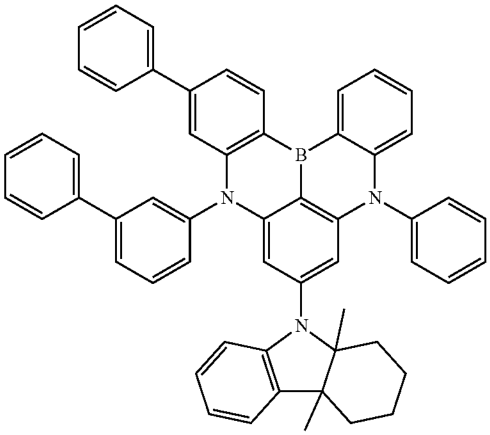
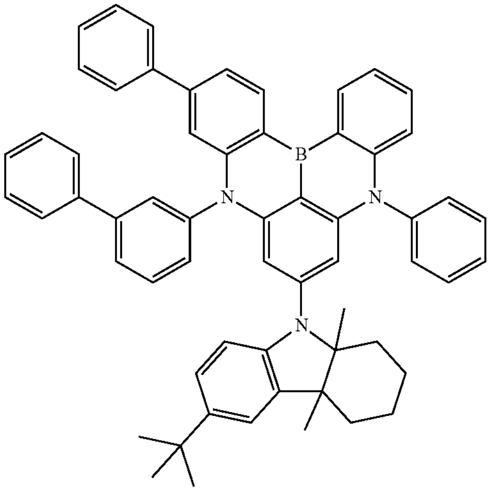

-continued
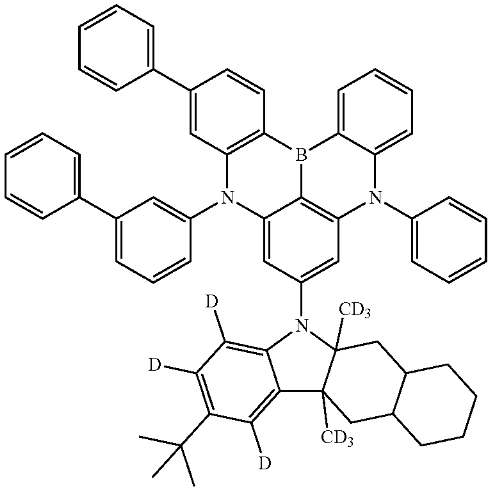
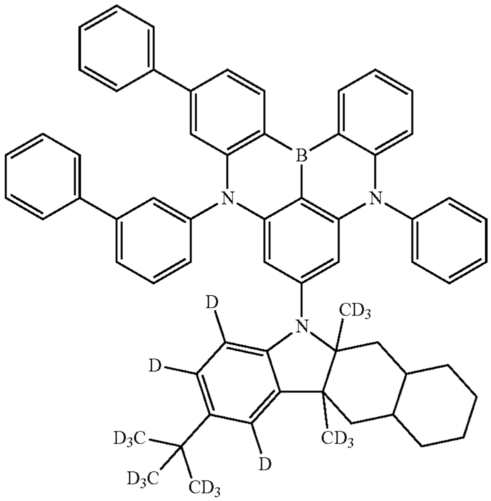
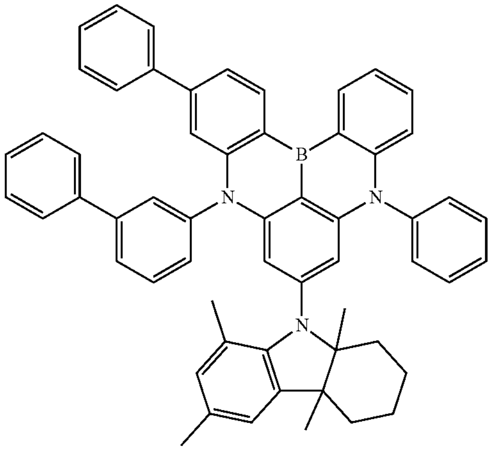
-continued
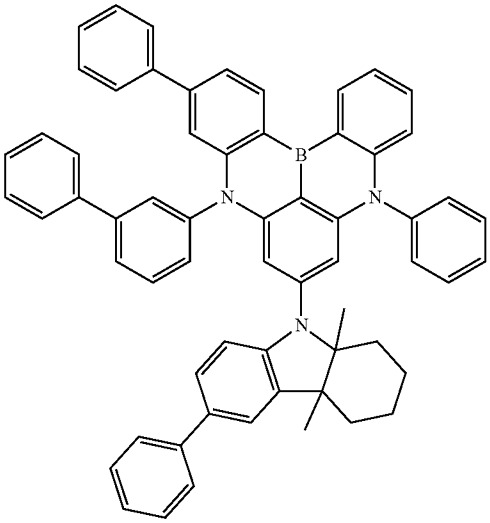
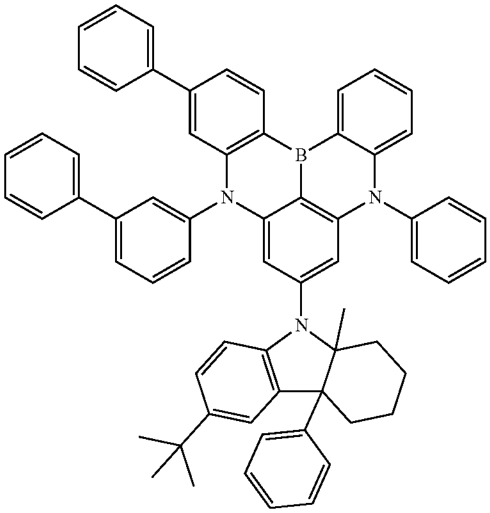
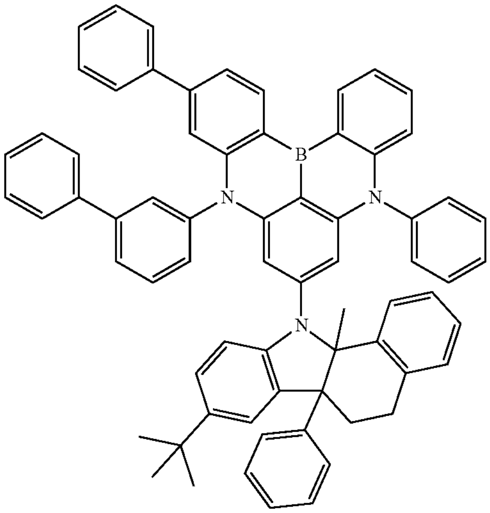

-continued
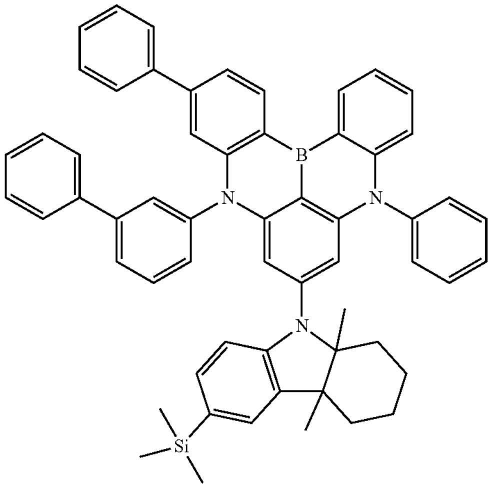
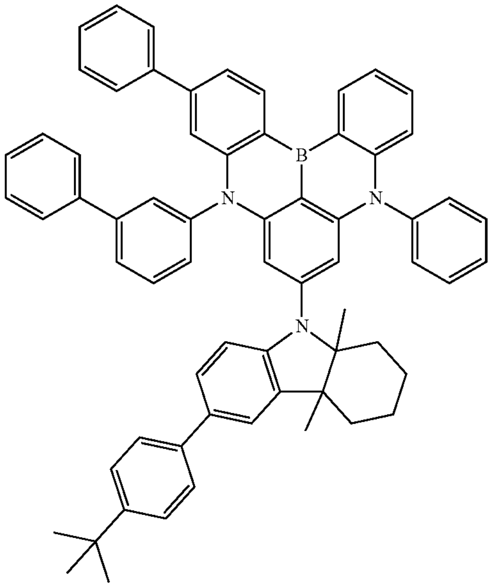
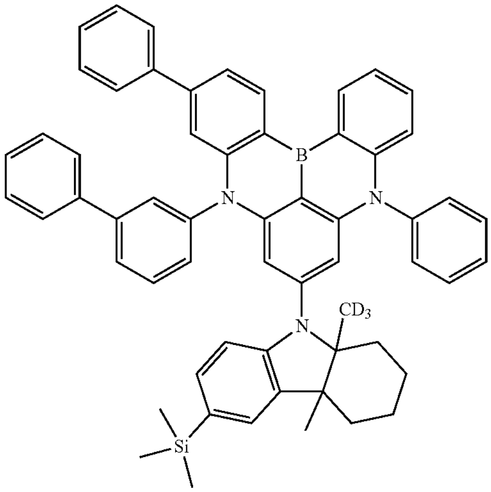
-continued
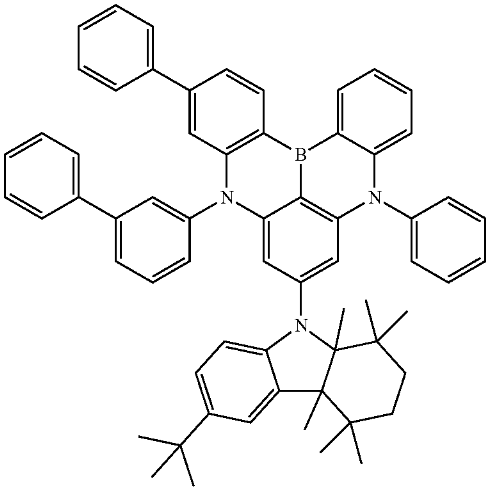
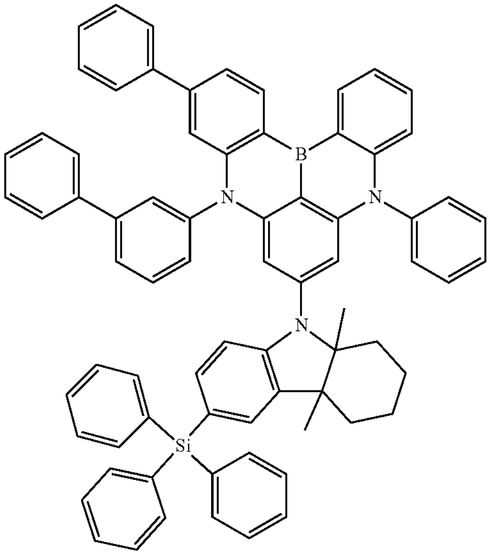
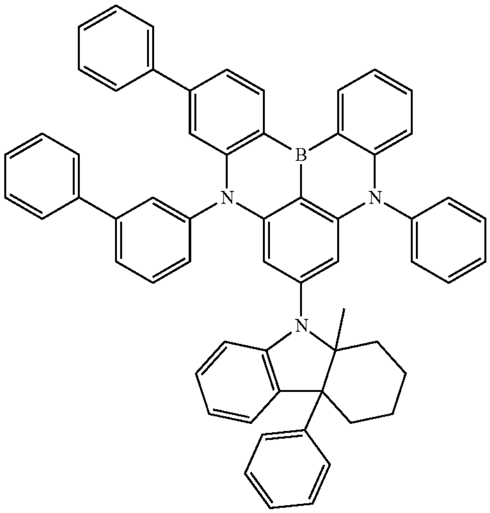

-continued
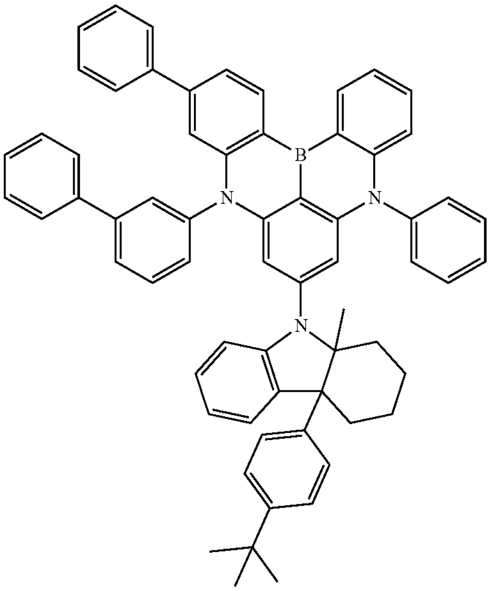
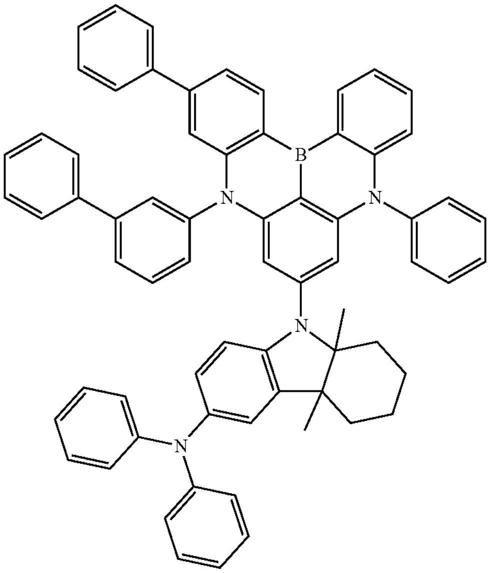
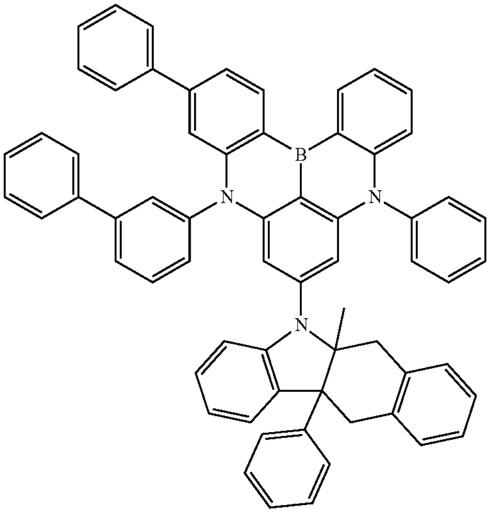
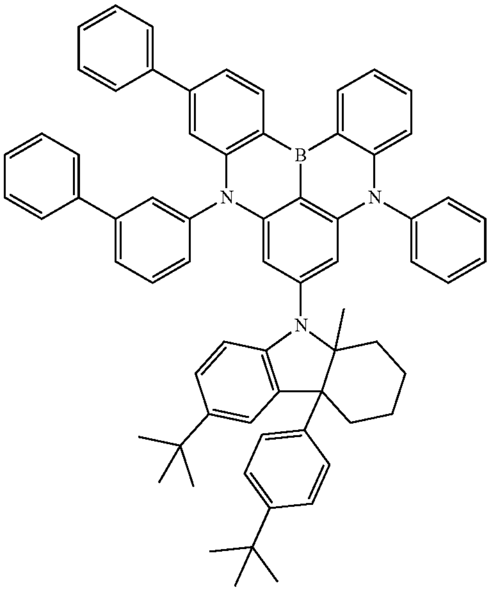
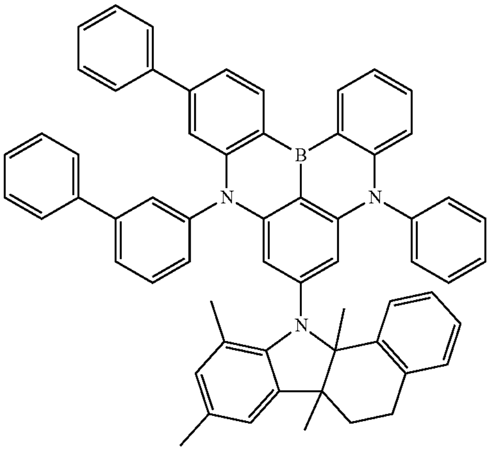

-continued
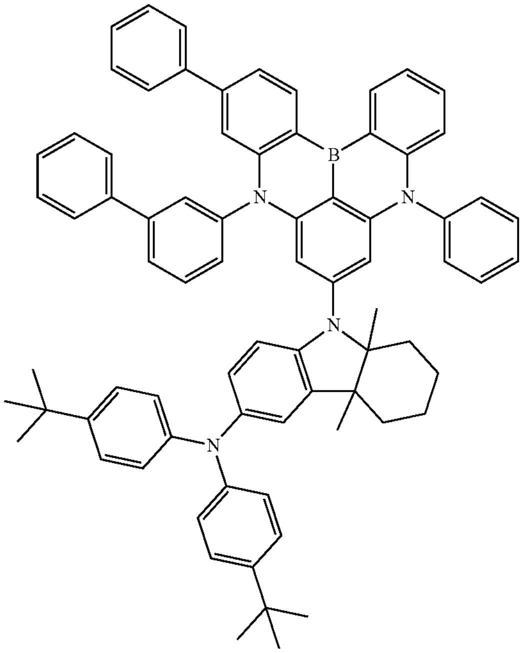
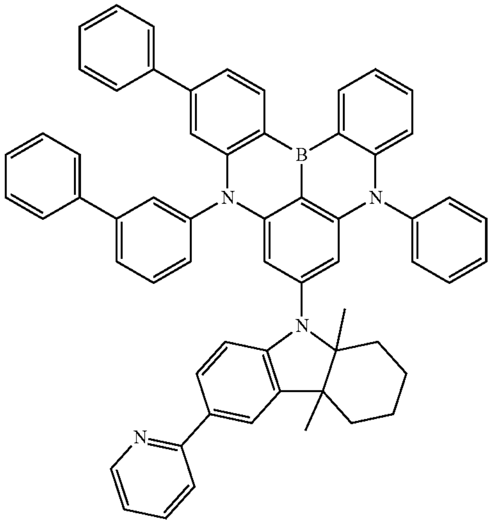
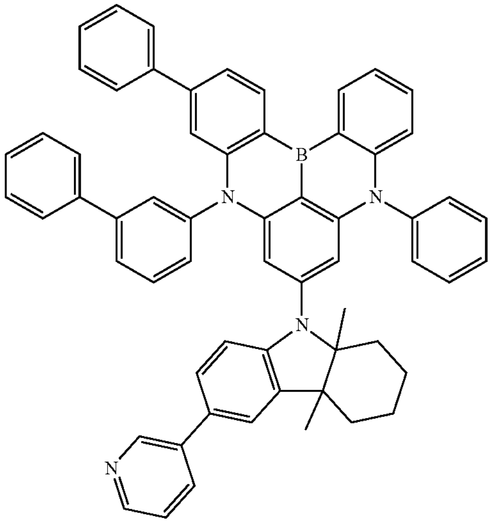
-continued
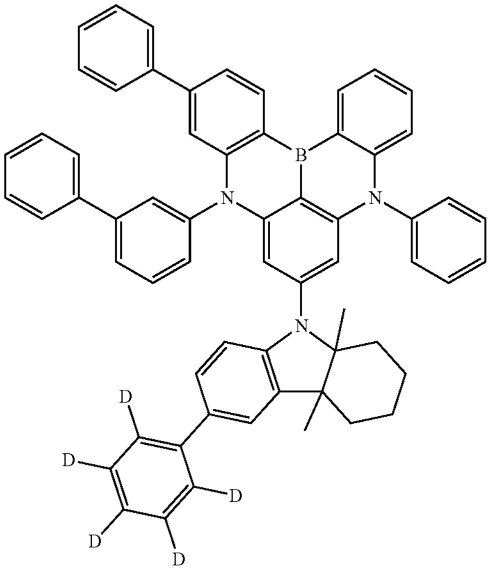
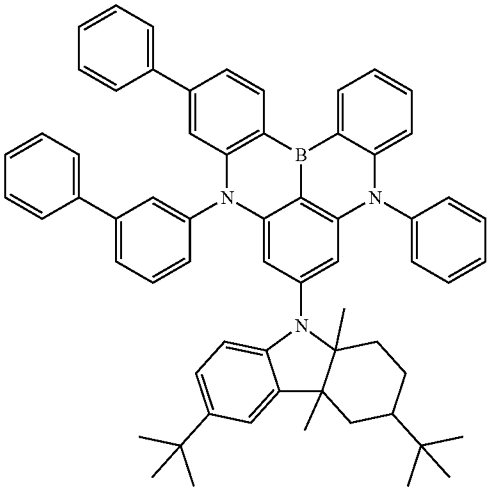
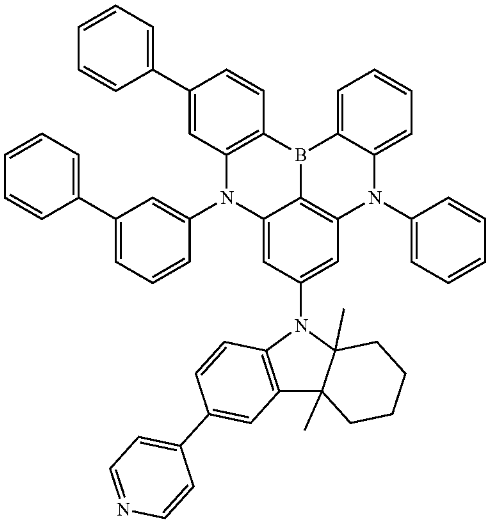

-continued
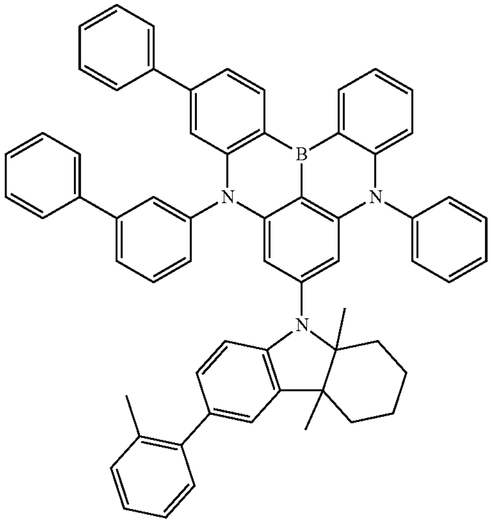
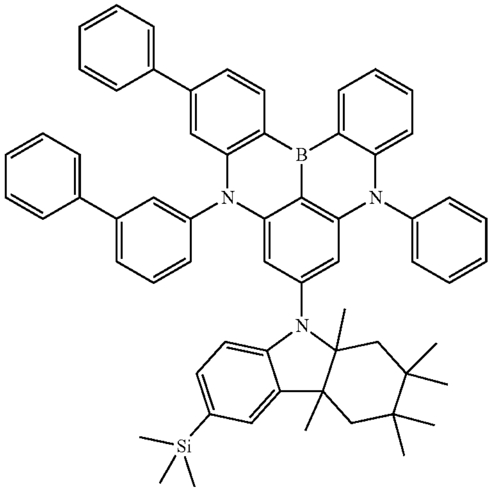
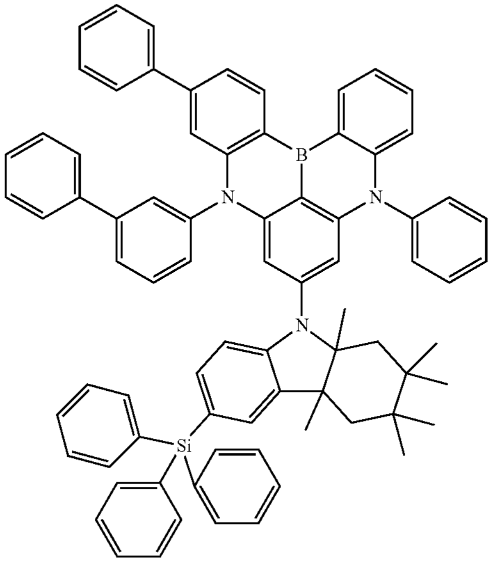
-continued
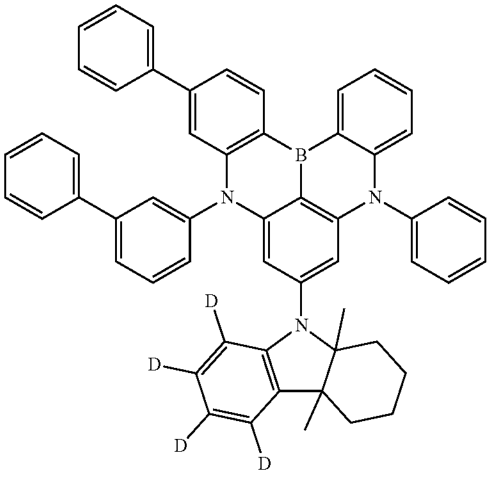
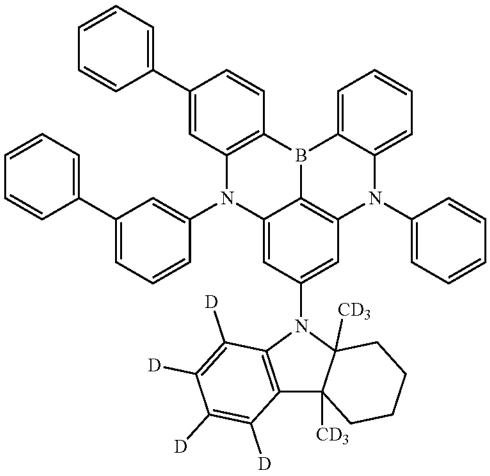
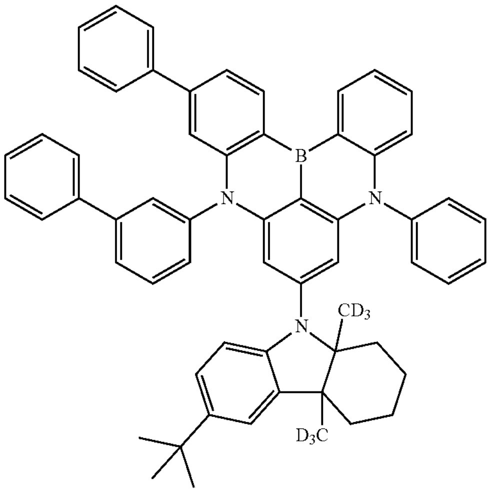

-continued
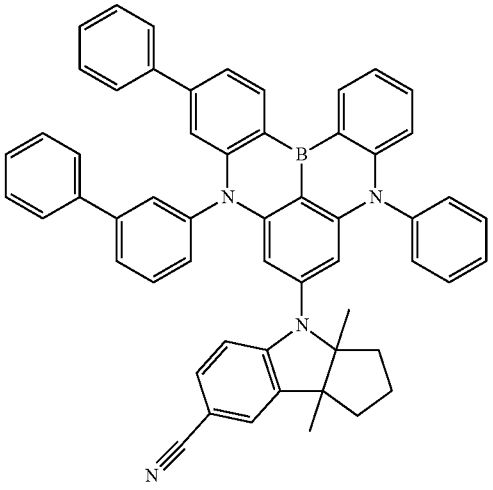
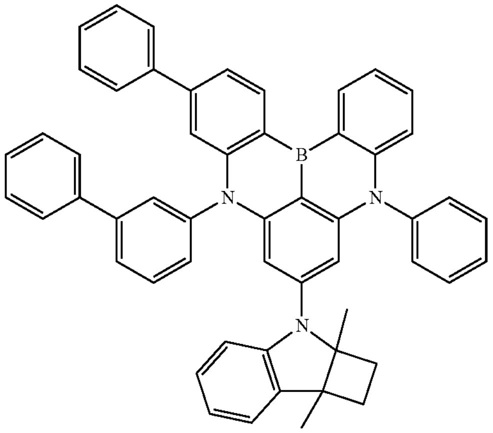
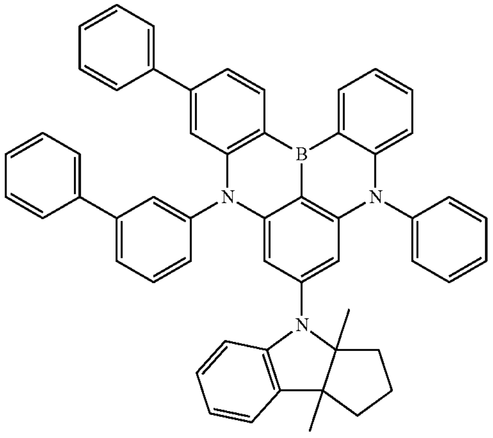
-continued
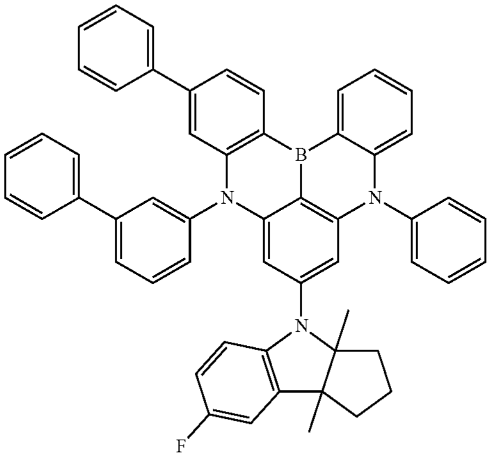
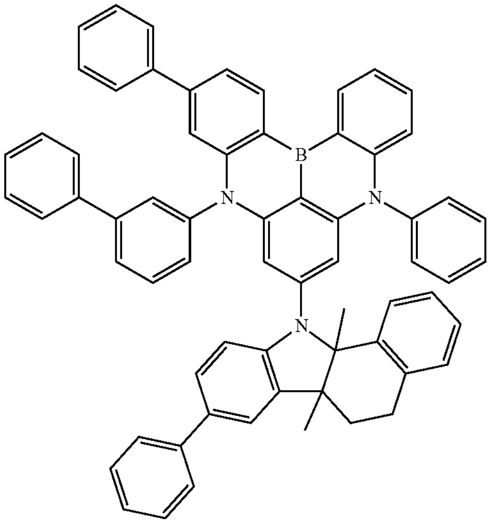
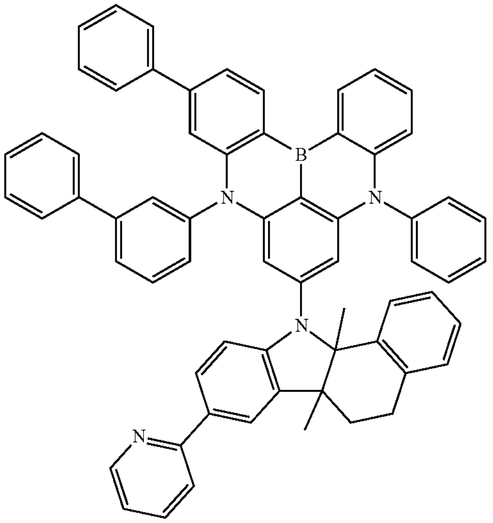

-continued
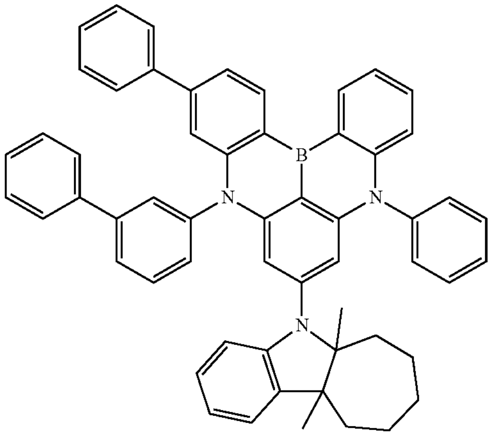
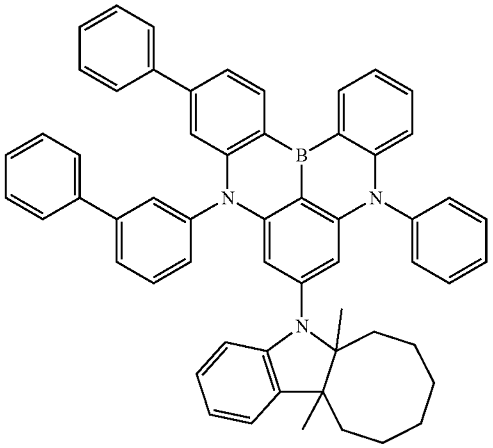
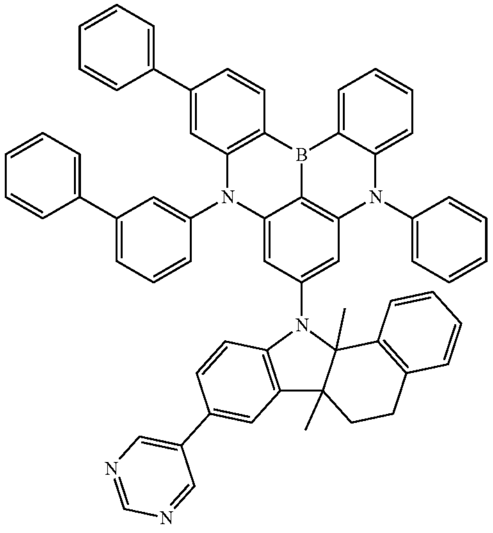
-continued
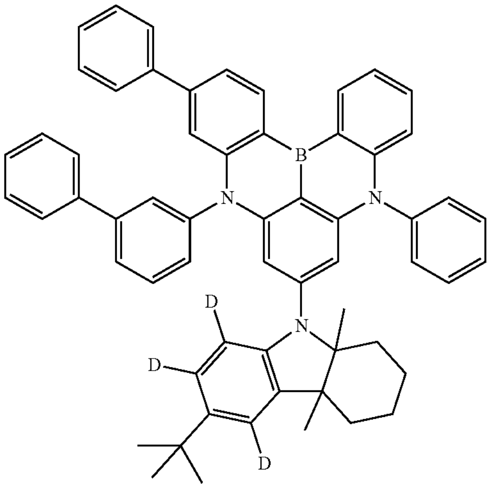
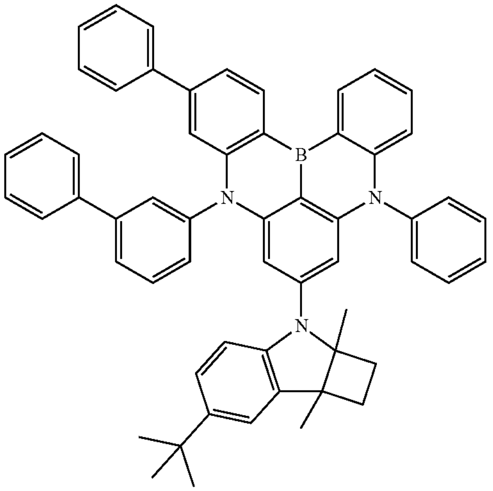
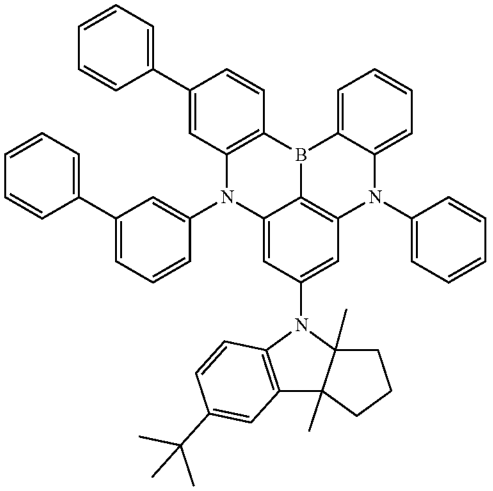

-continued
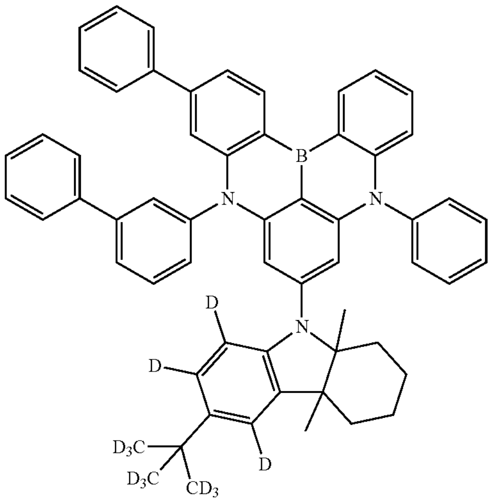
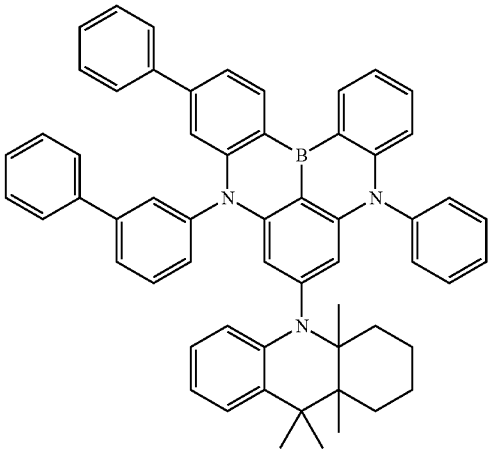
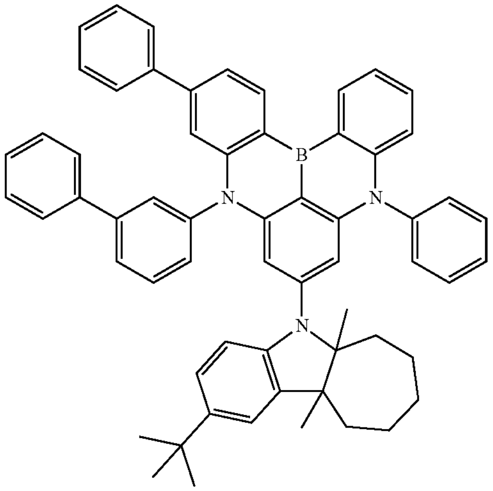
-continued
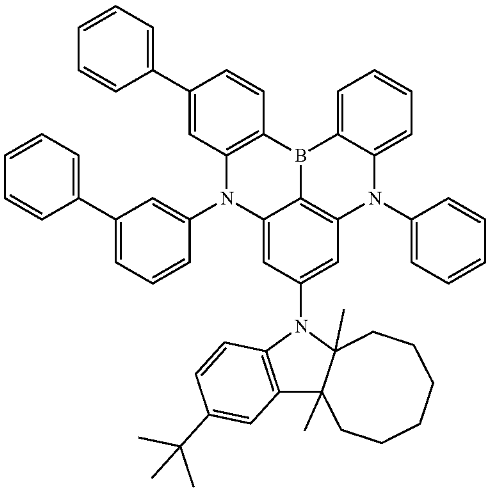
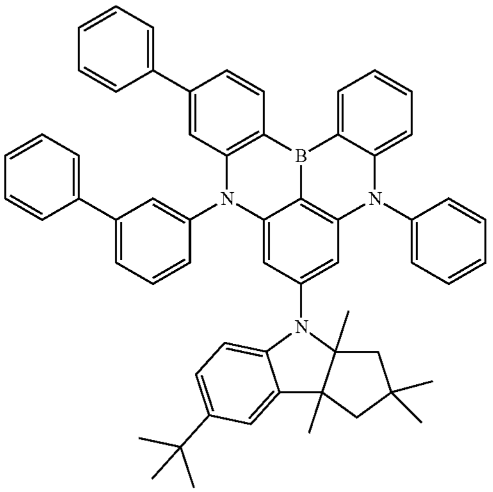
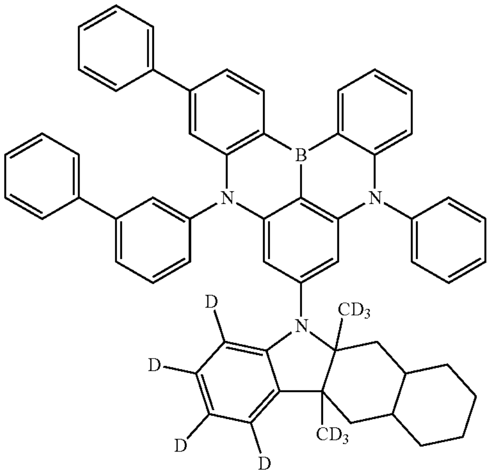

-continued
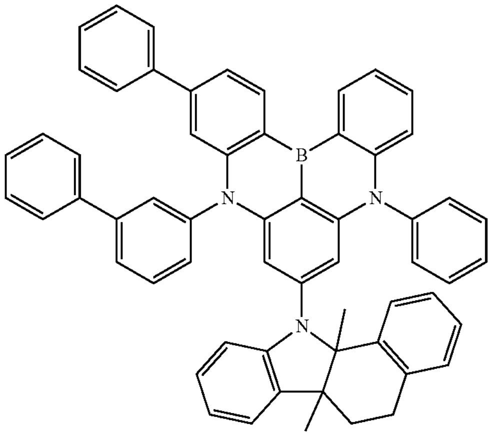
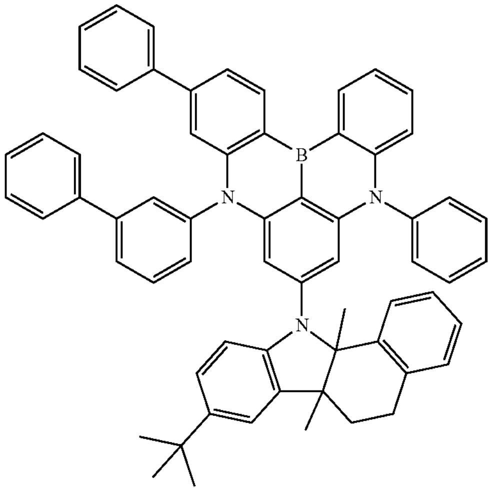
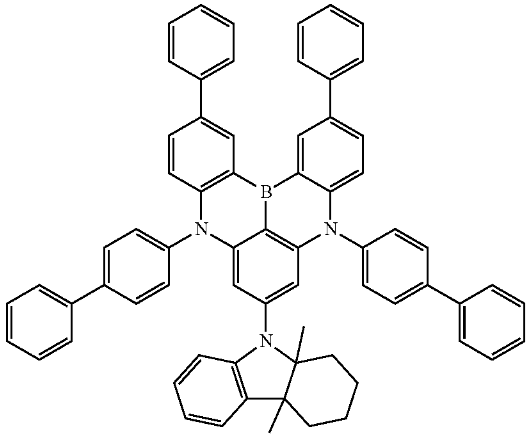
-continued
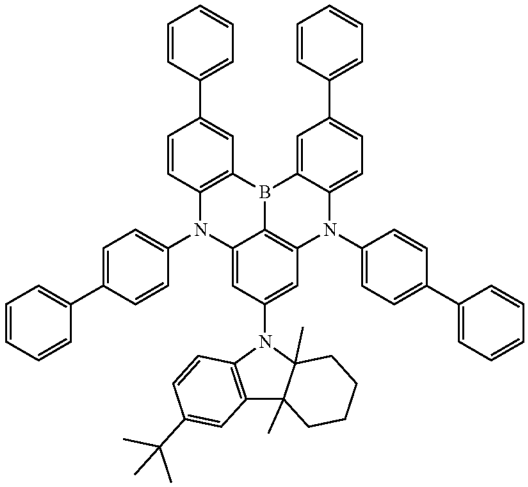
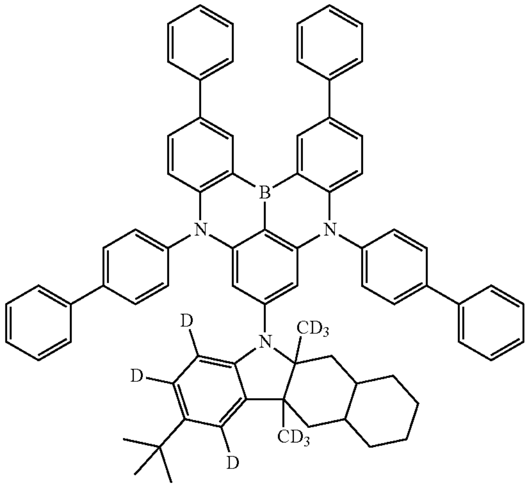
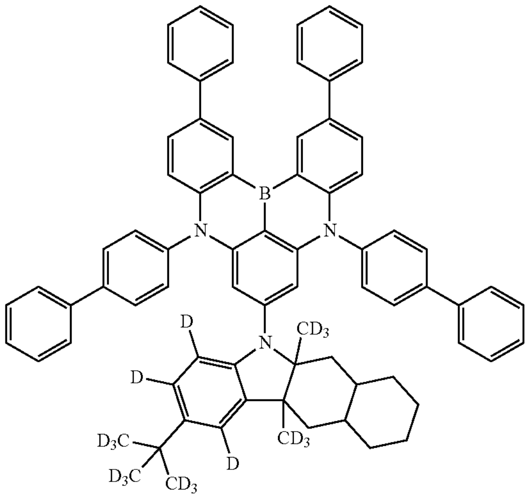

-continued
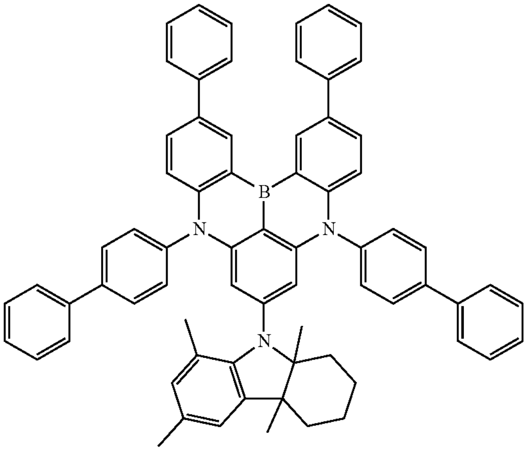
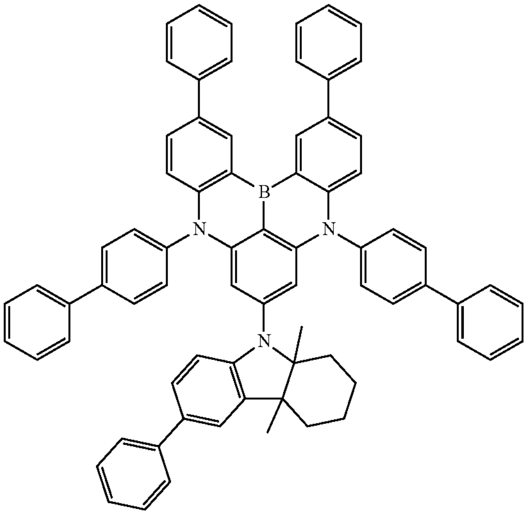
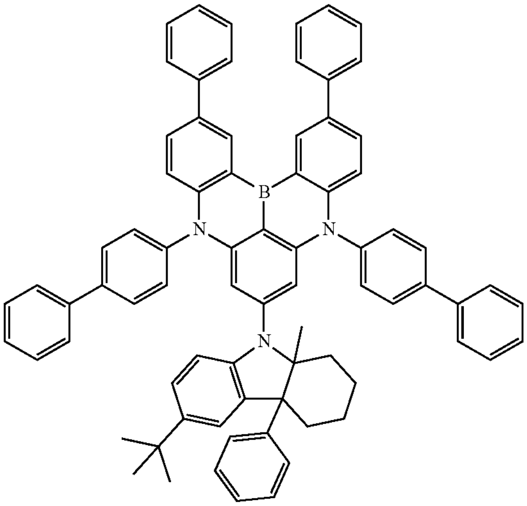
-continued
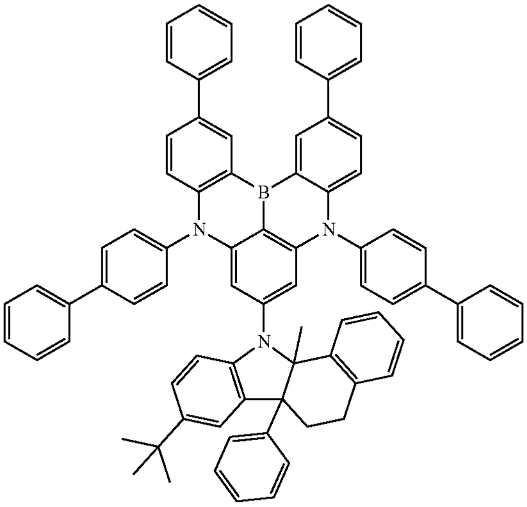
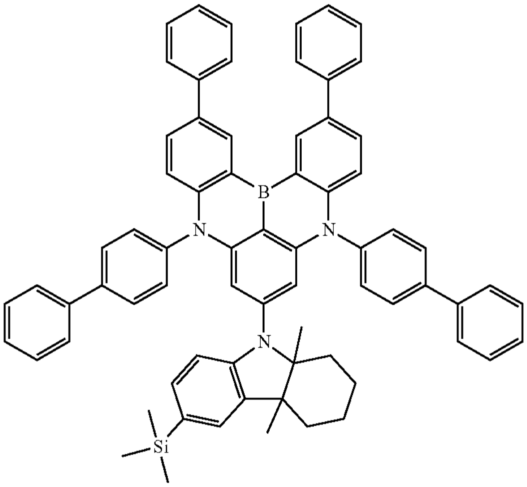
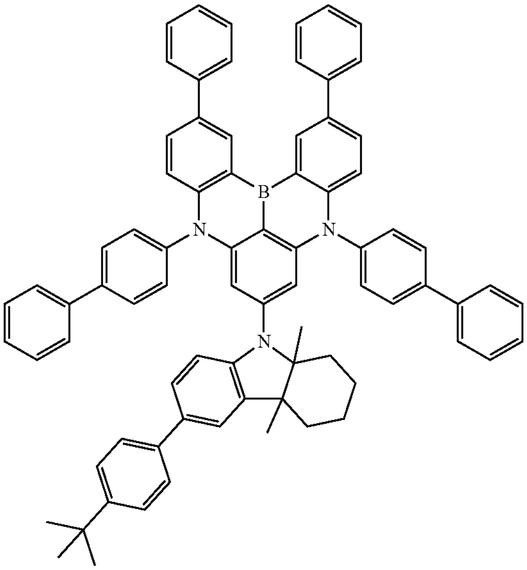

-continued
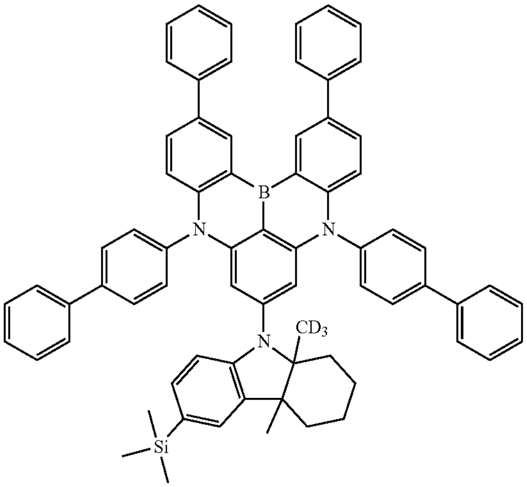
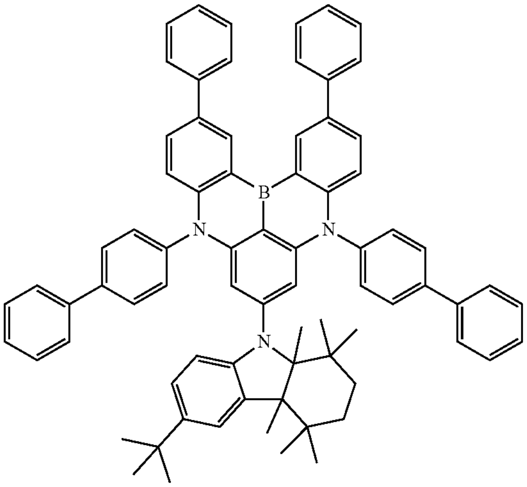
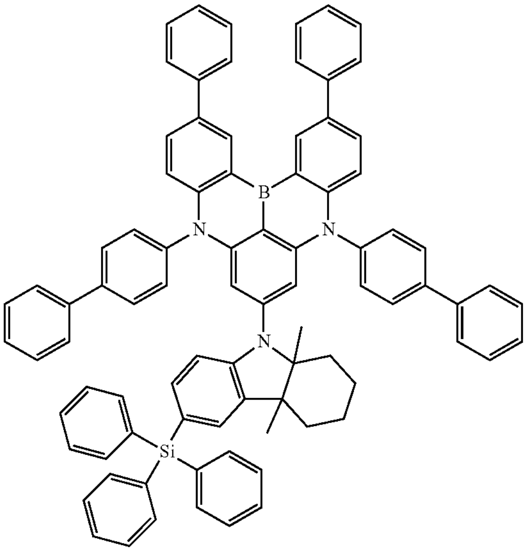
-continued
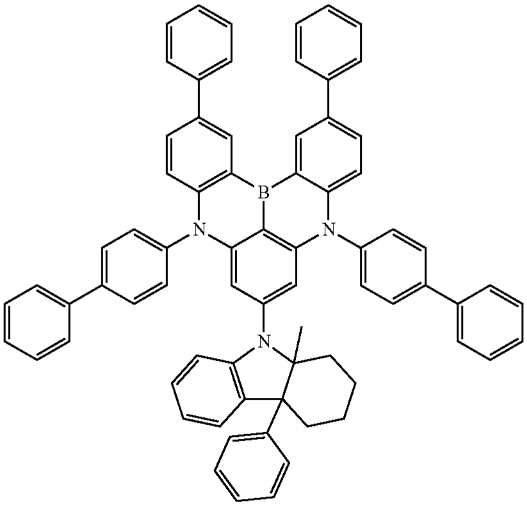
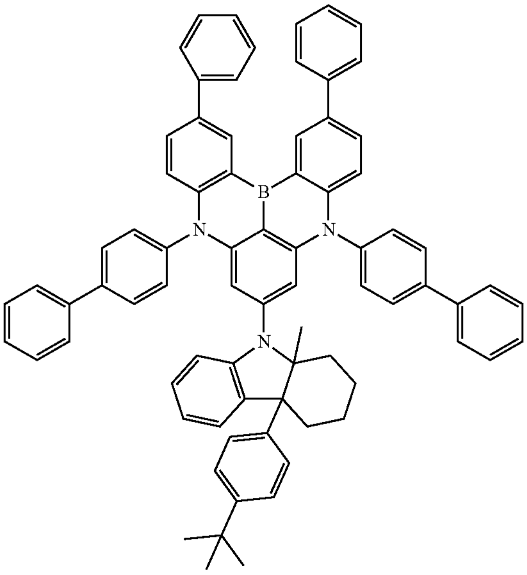
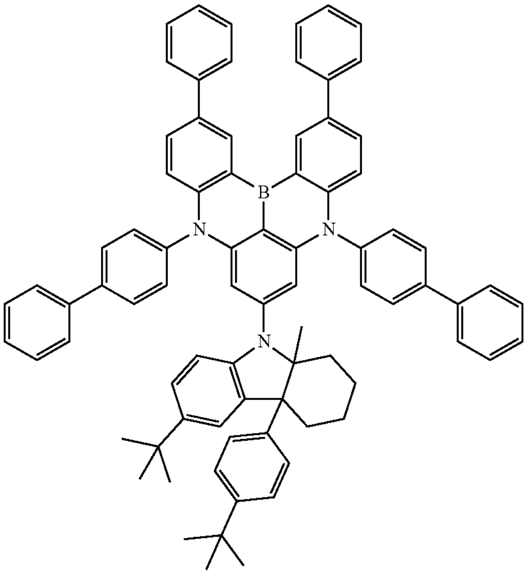

-continued
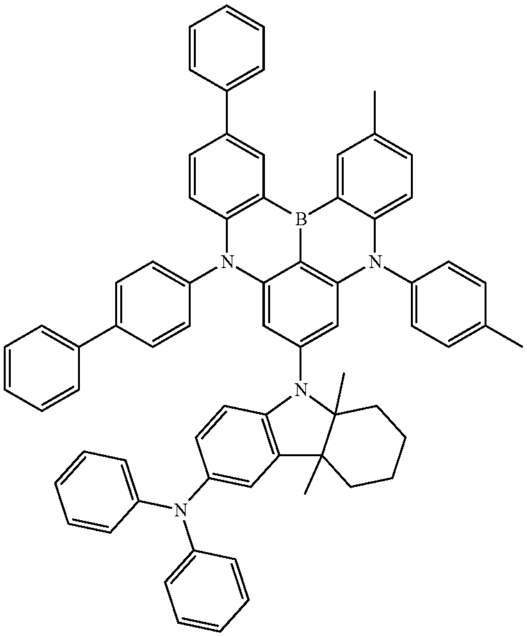
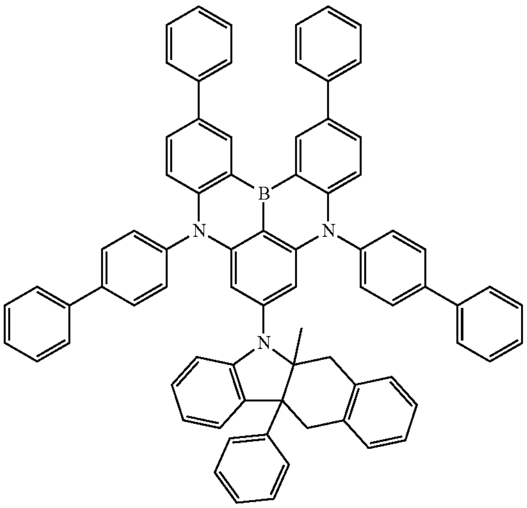
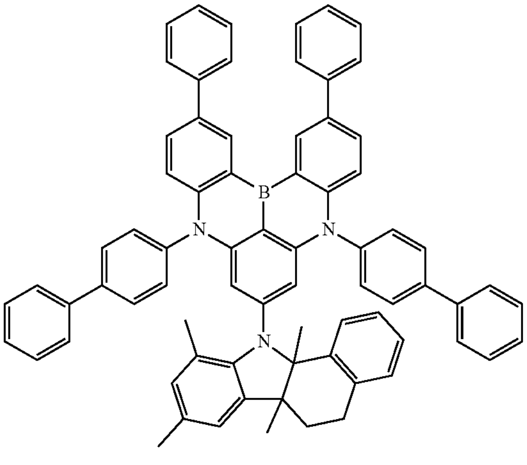
-continued
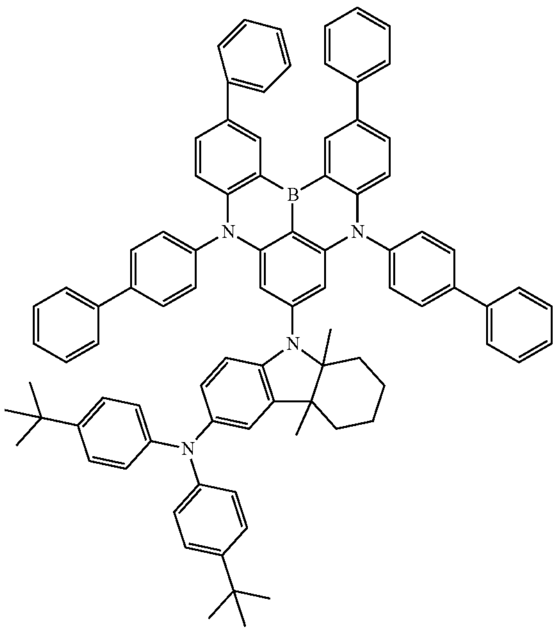
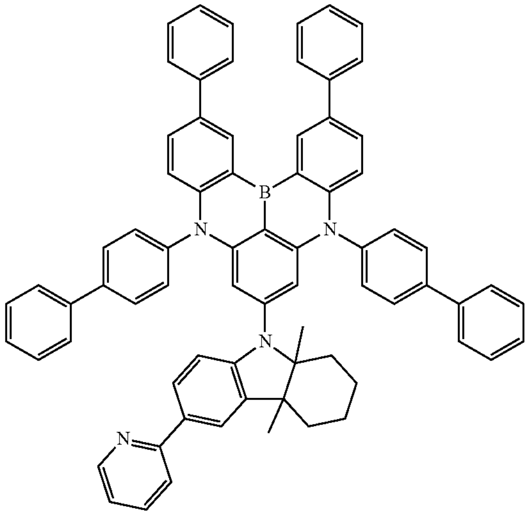
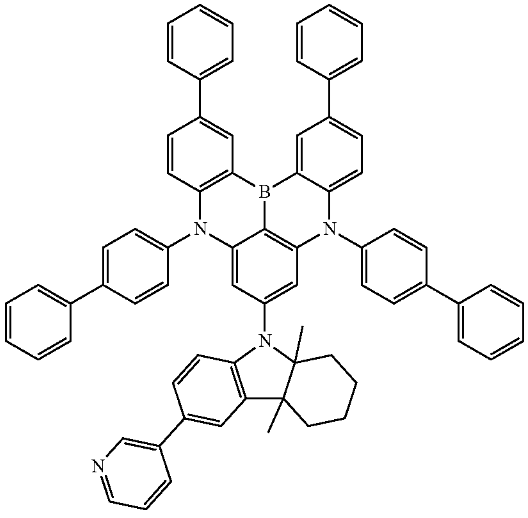

-continued
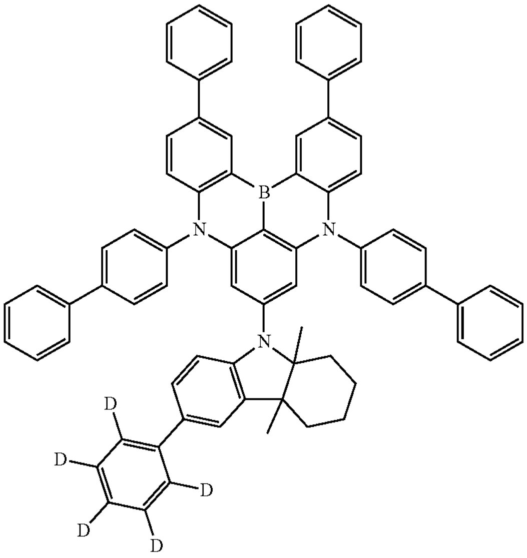
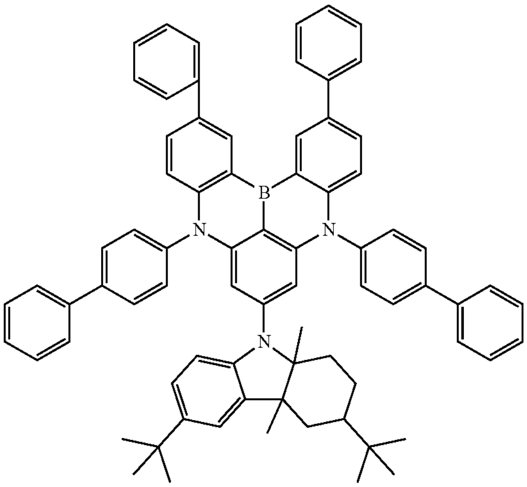
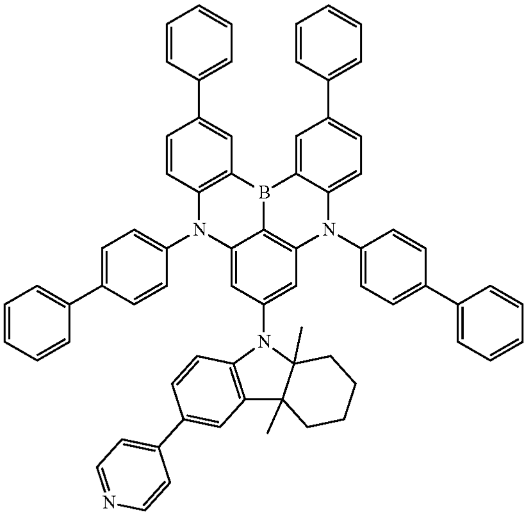
-continued
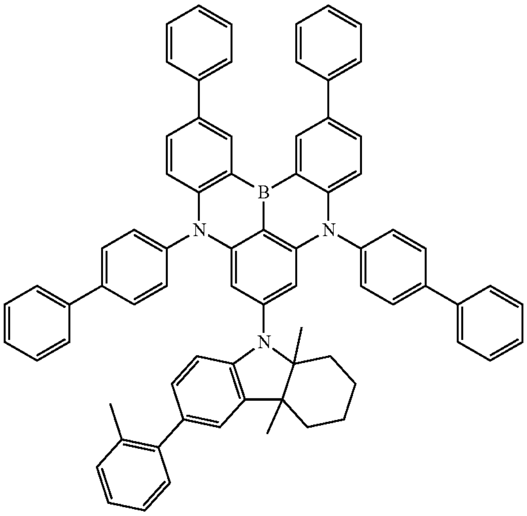
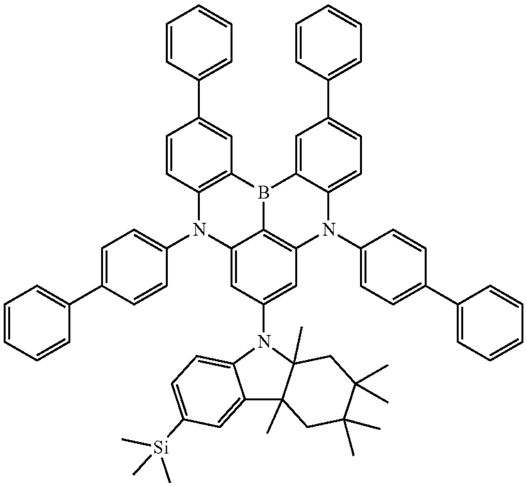
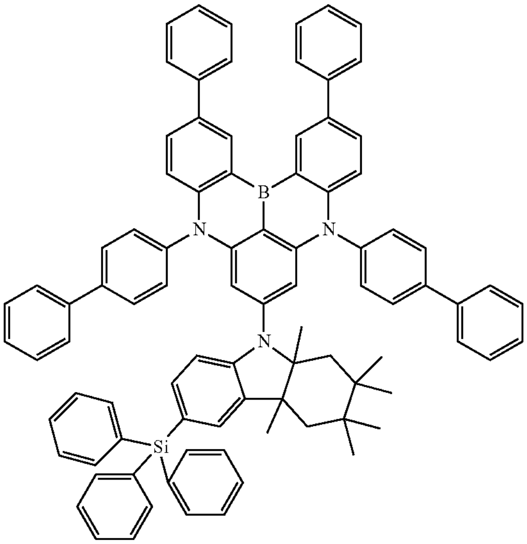

-continued
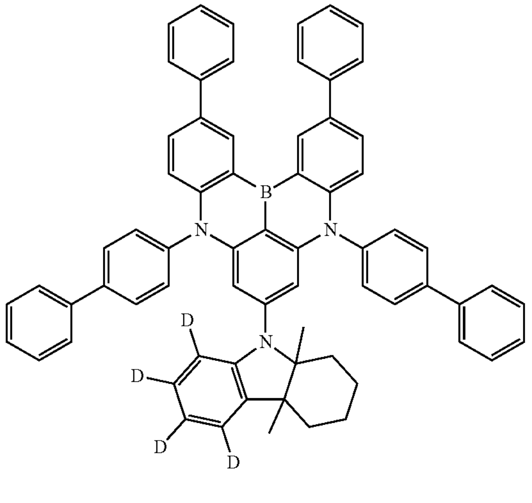
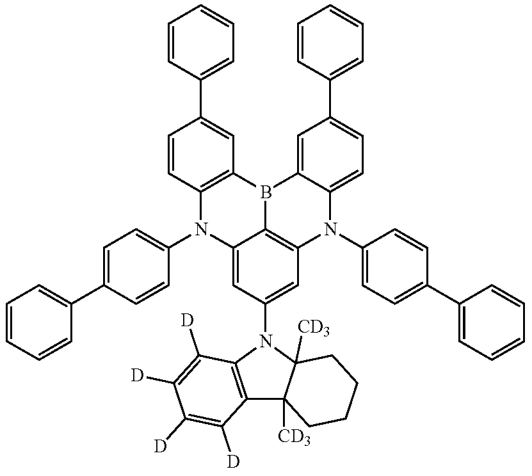
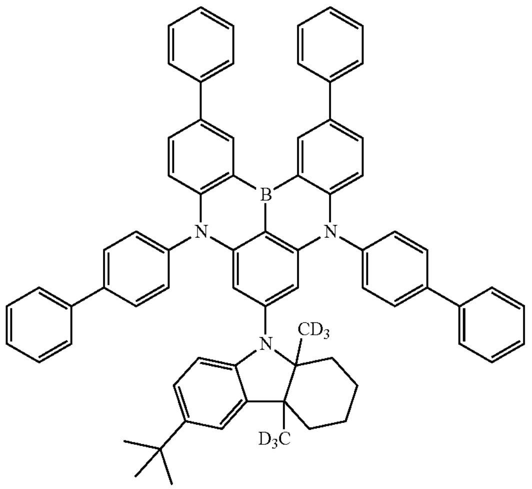
-continued
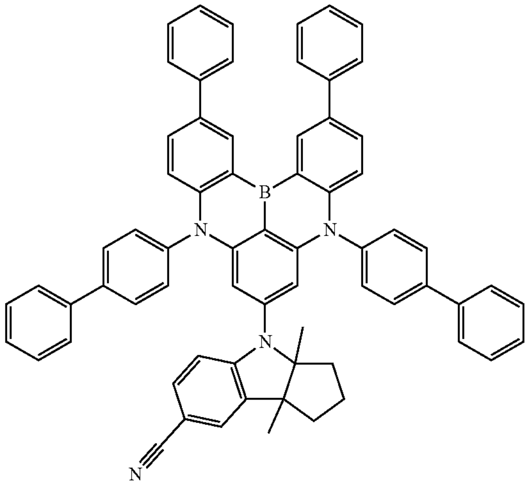
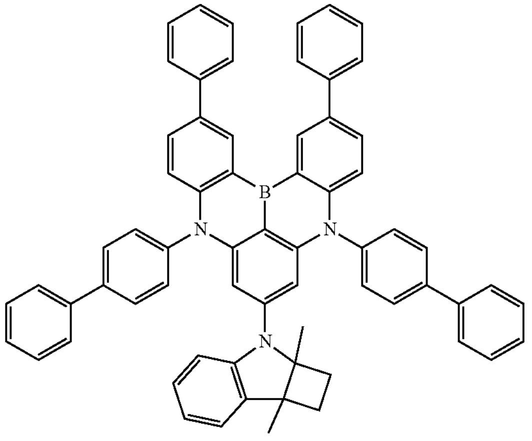
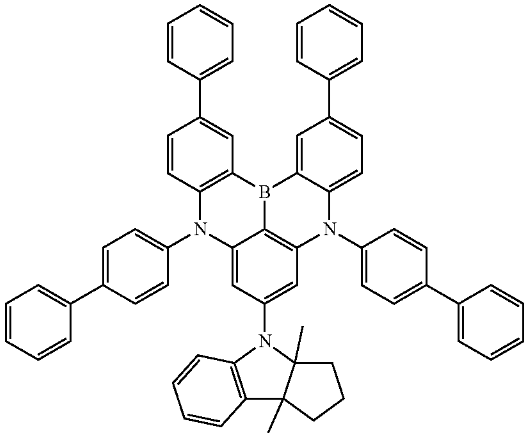

-continued
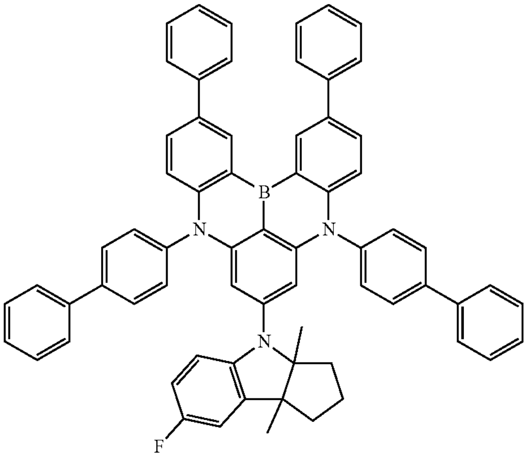
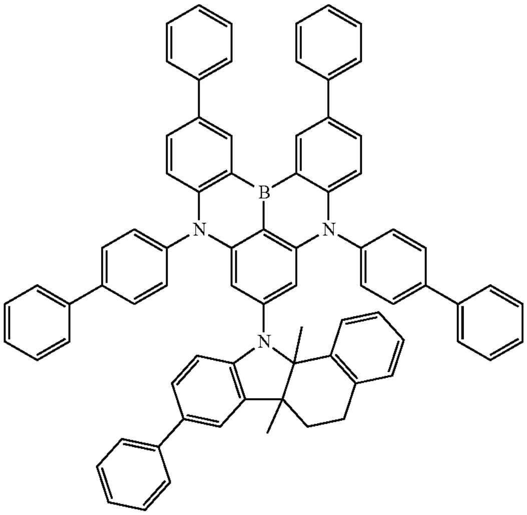
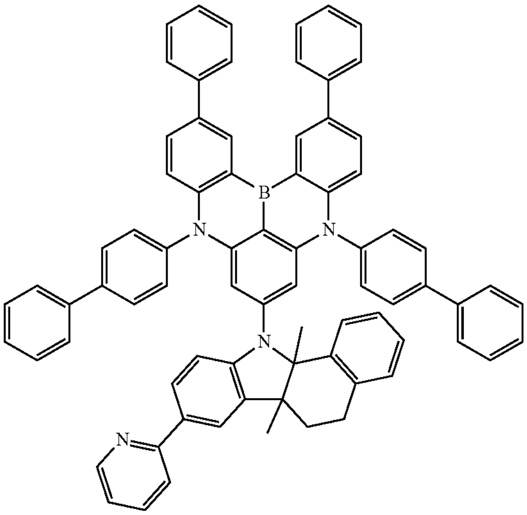
-continued
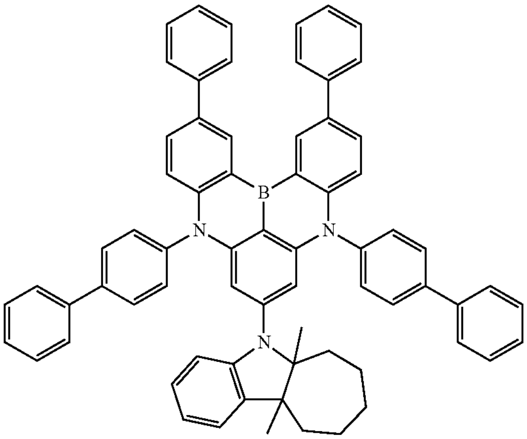
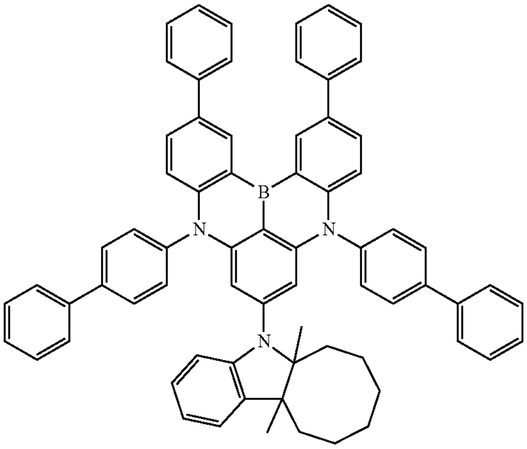
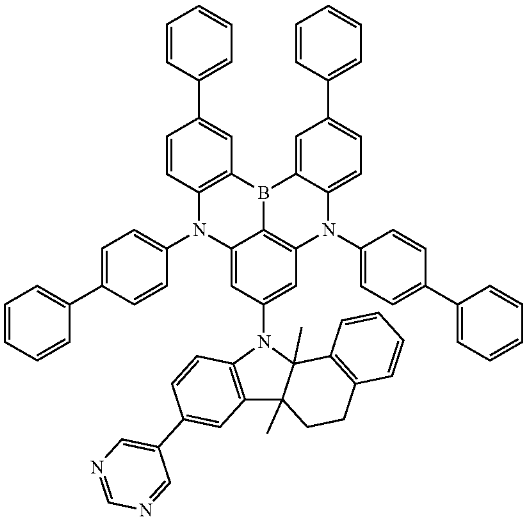

-continued
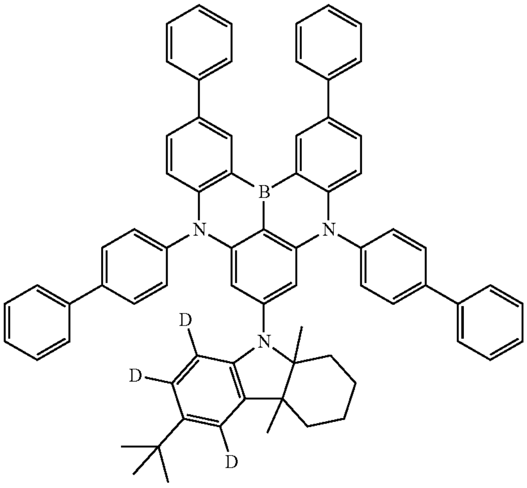
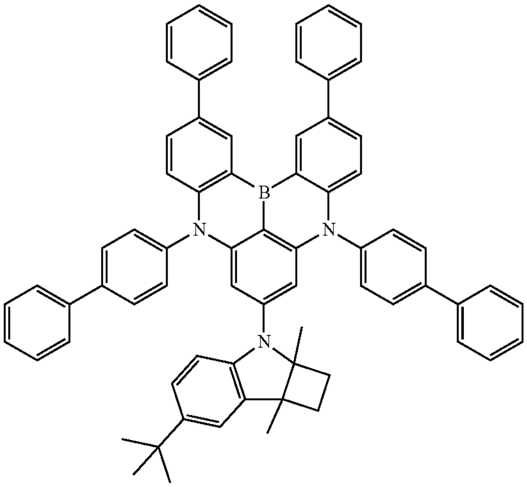
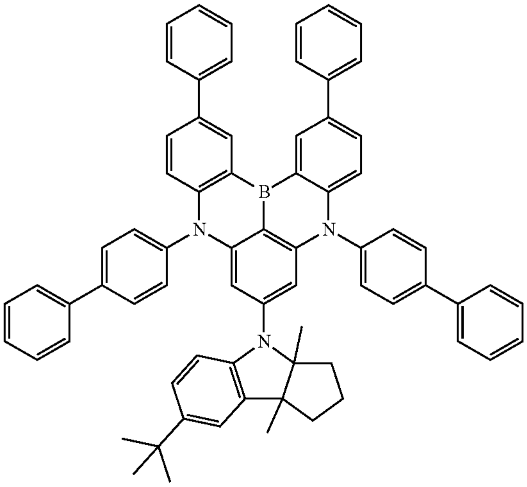
-continued
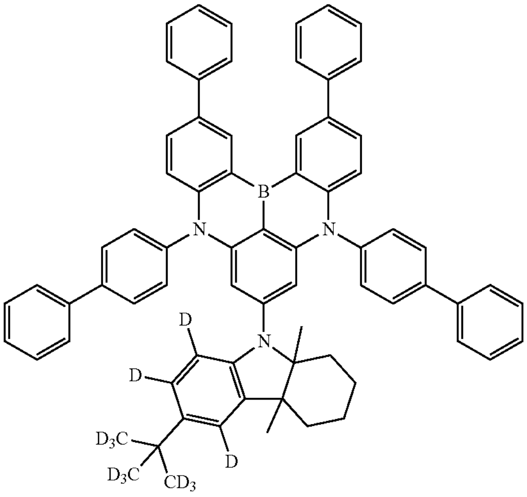
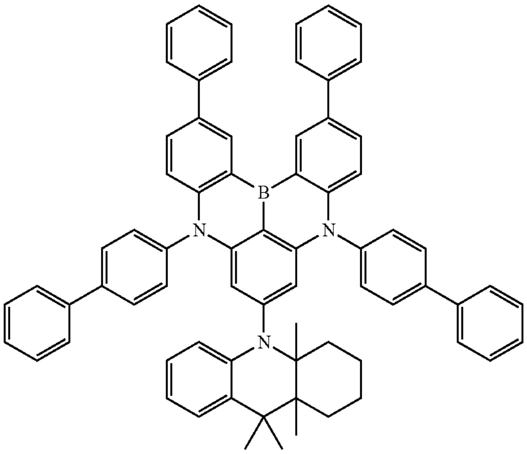
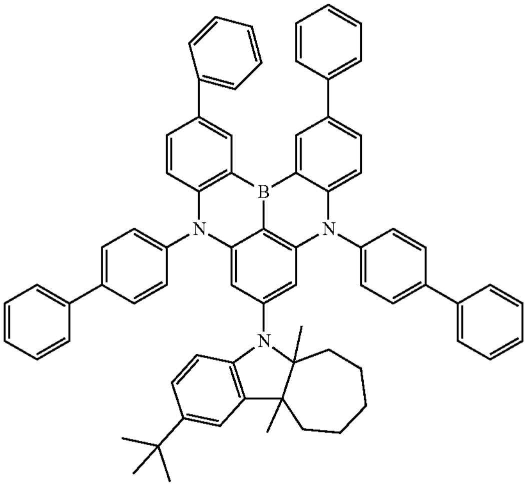

-continued
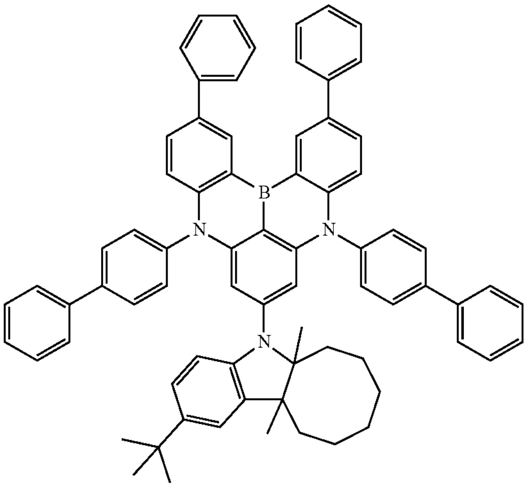
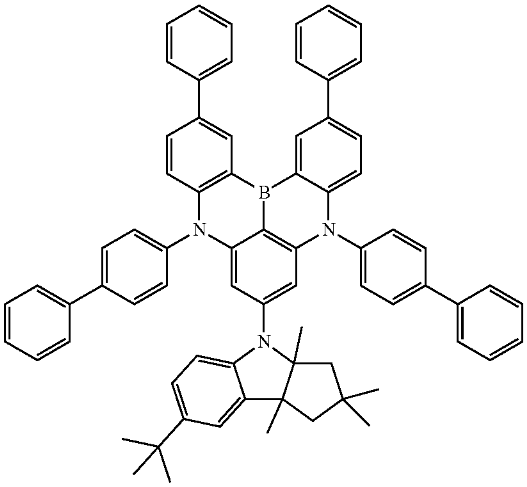
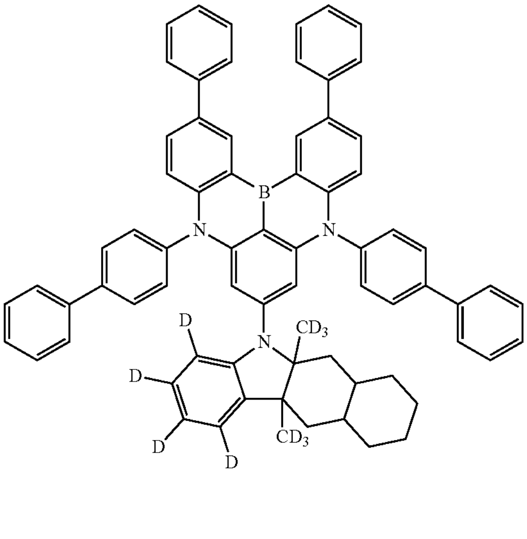
-continued
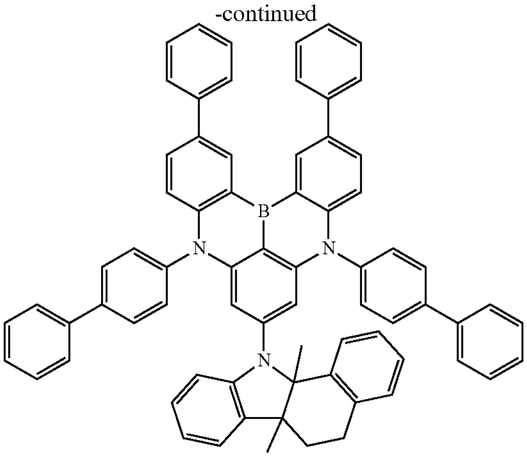
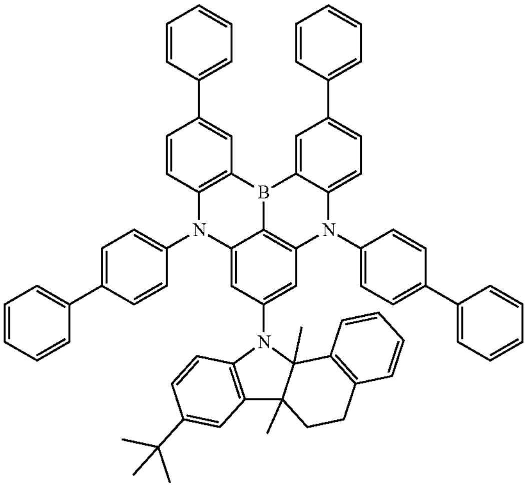
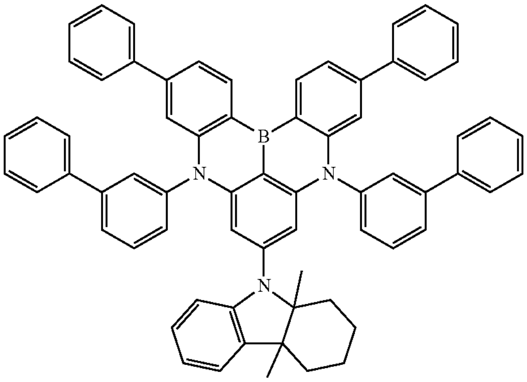
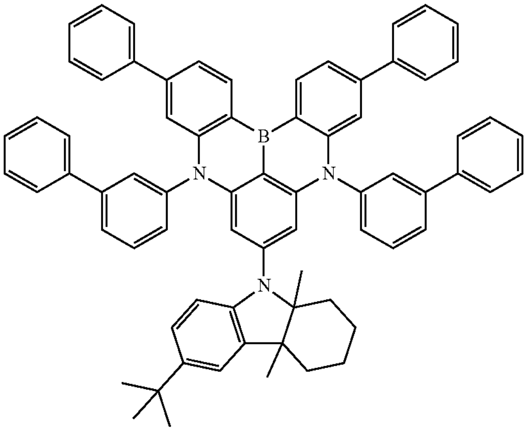

-continued
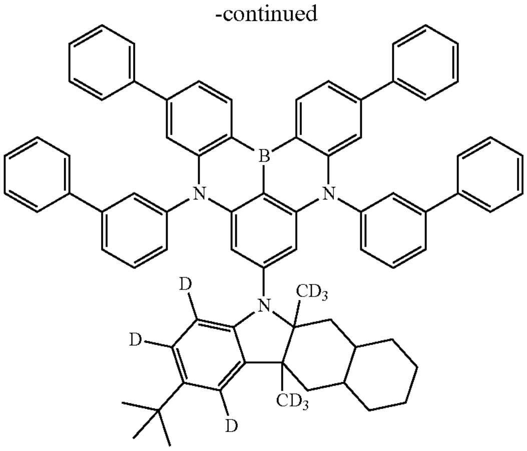
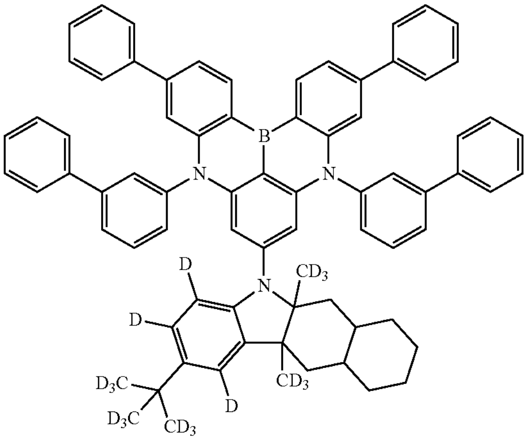
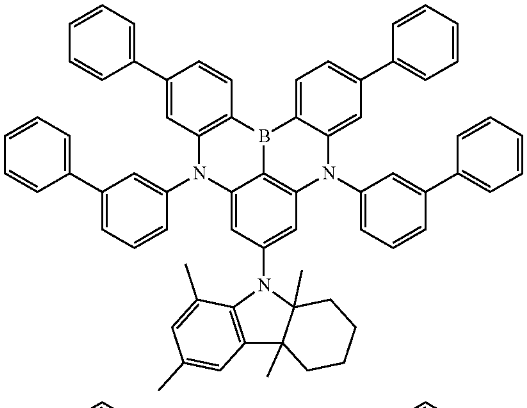
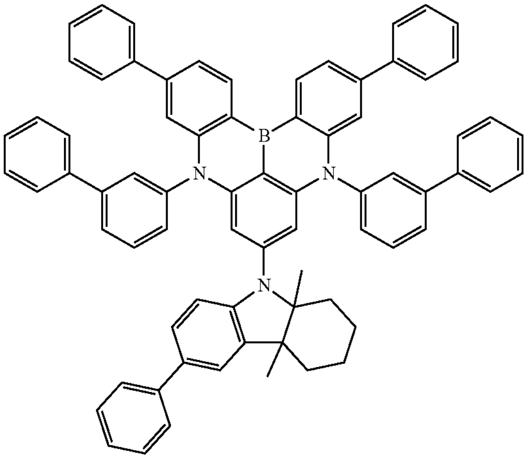
-continued
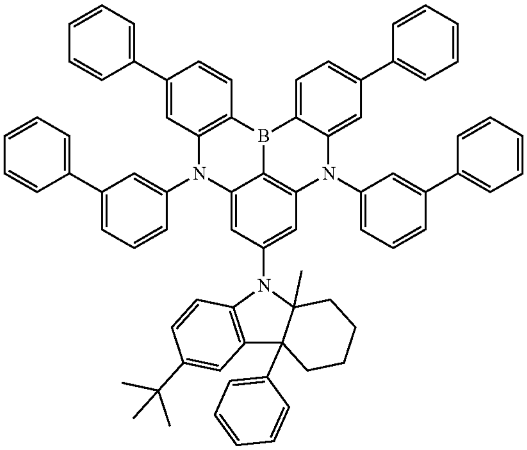
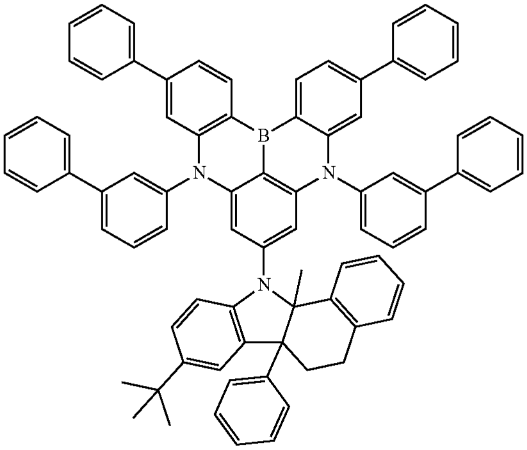
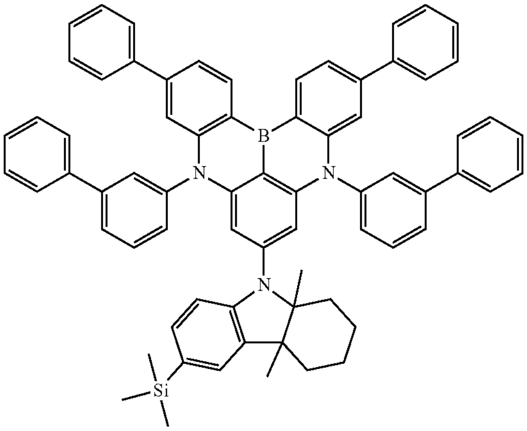

-continued
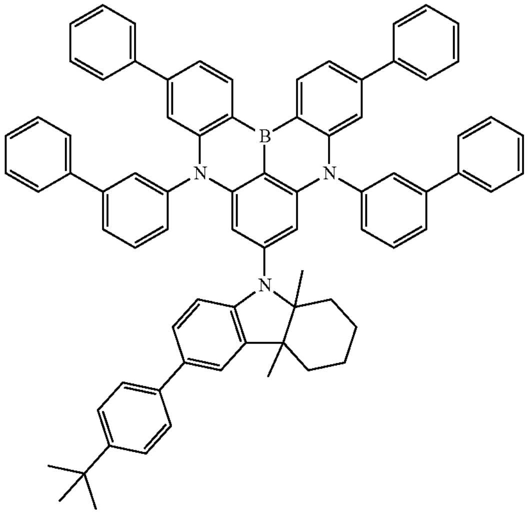
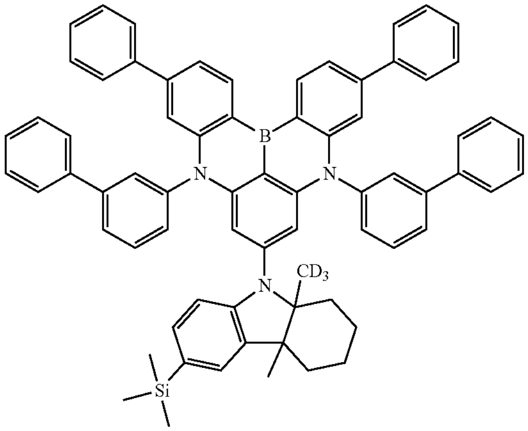
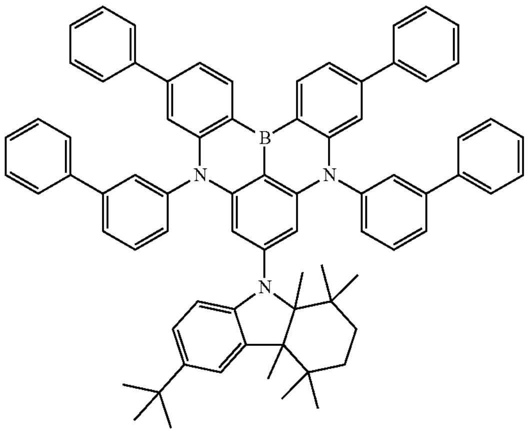
-continued
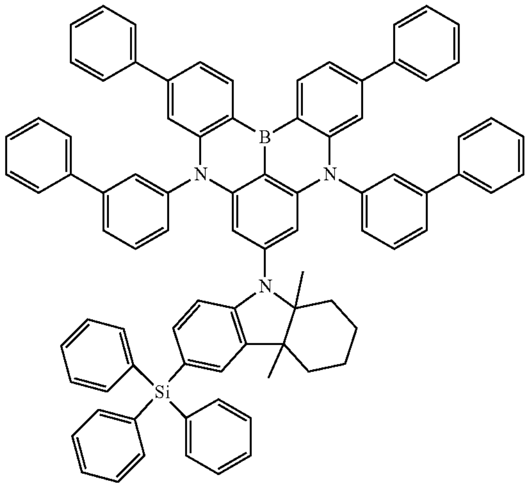
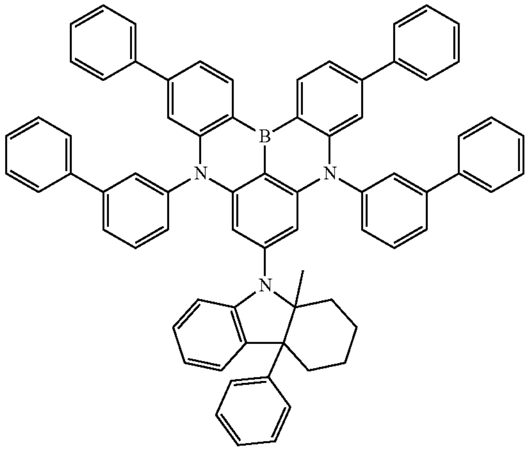
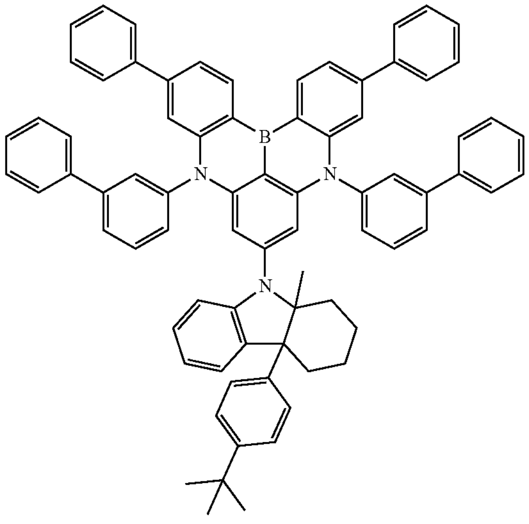

-continued
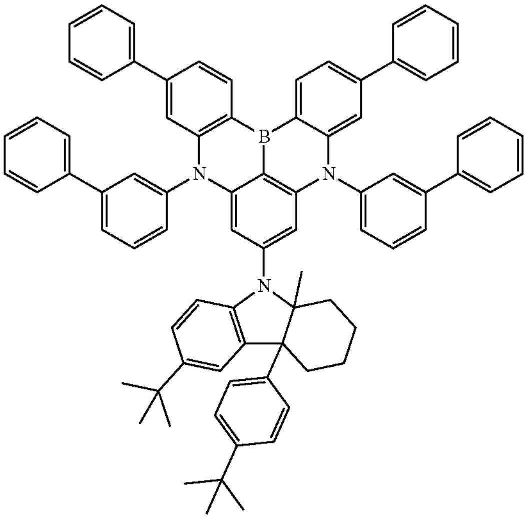
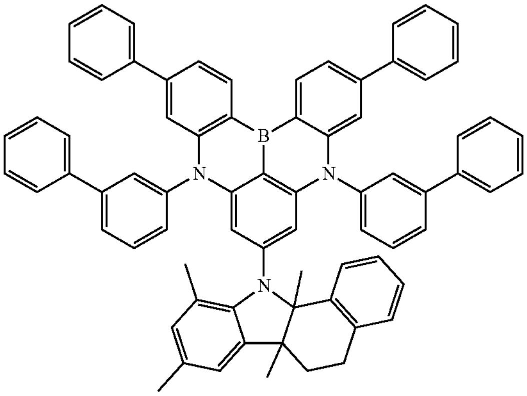
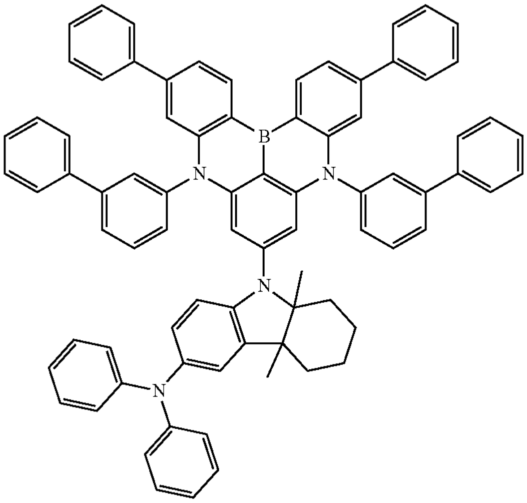
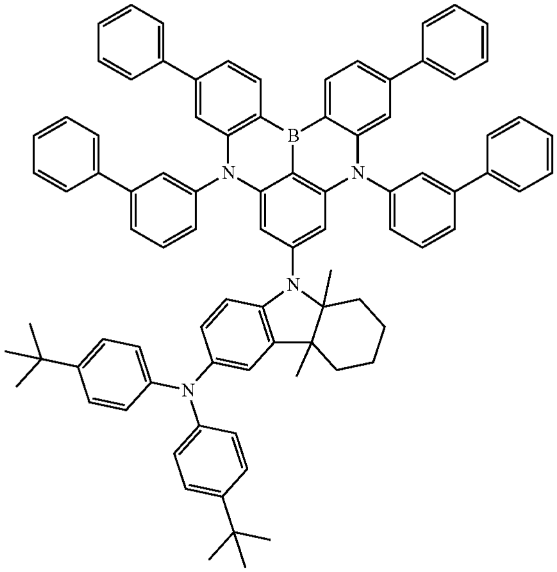
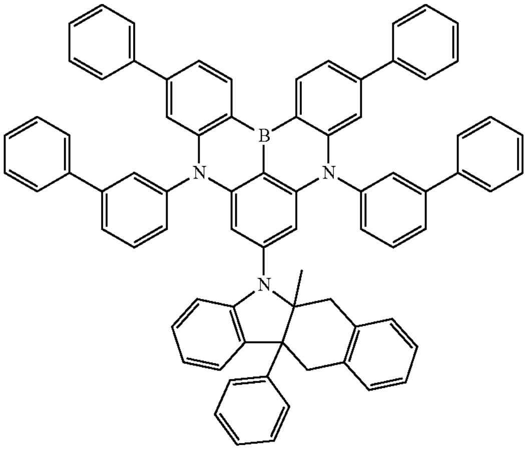
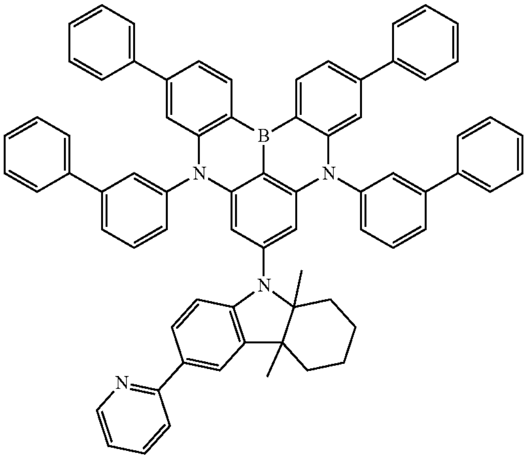

-continued
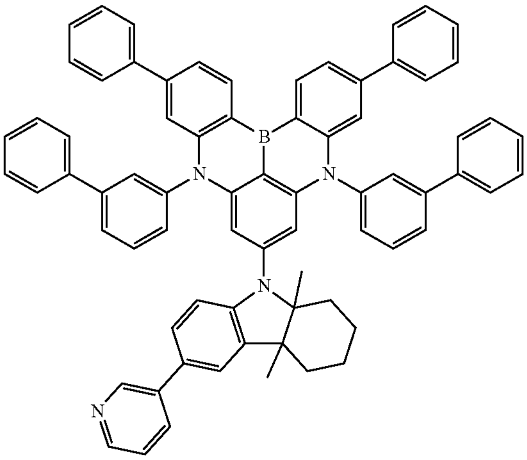
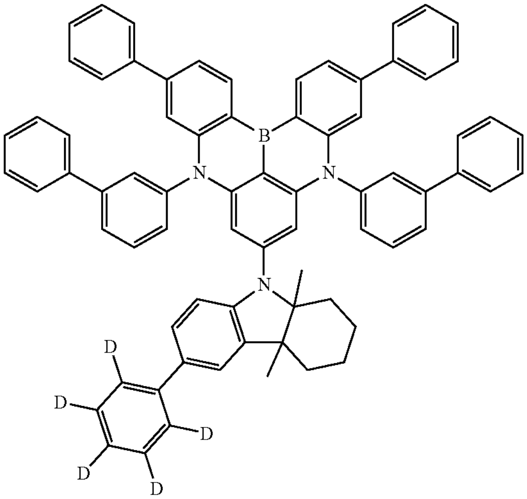
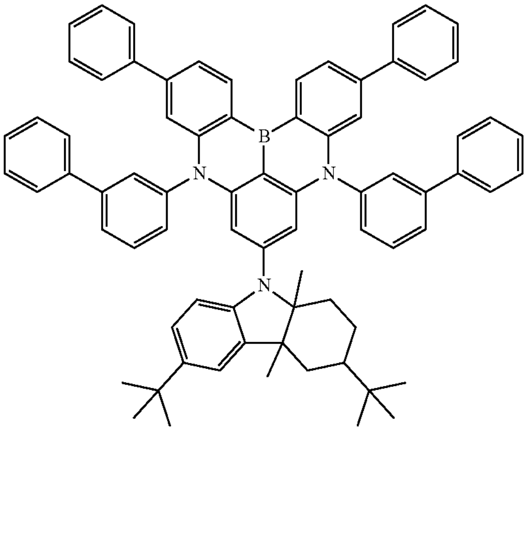
-continued
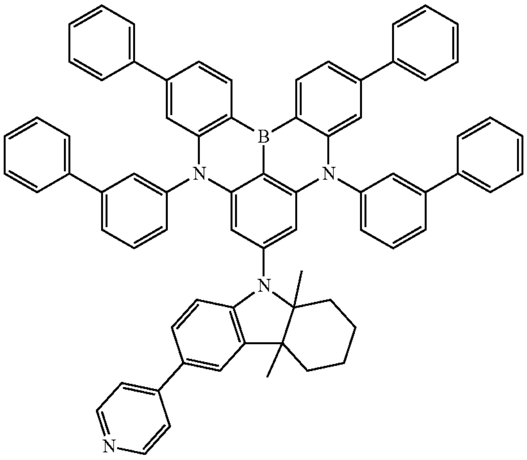
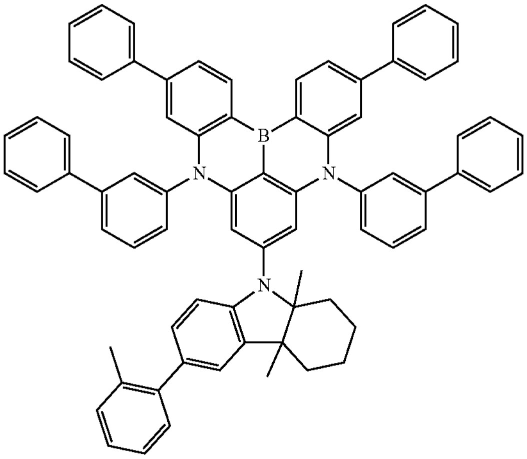
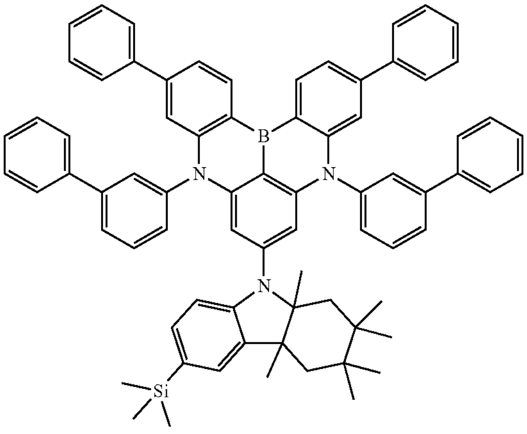

-continued
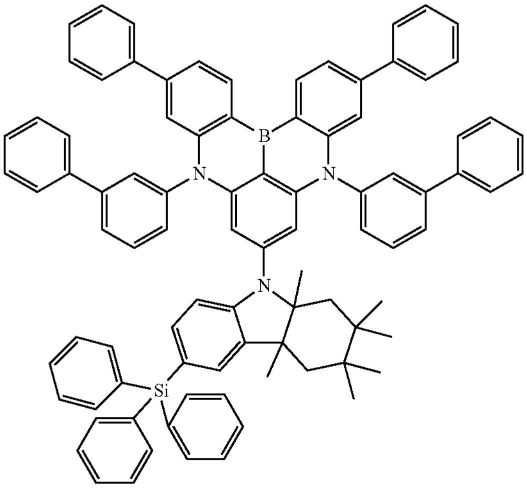
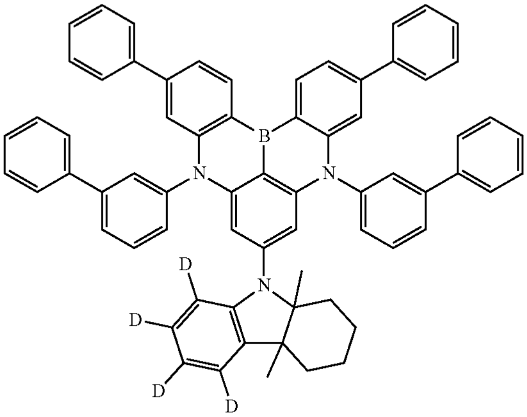
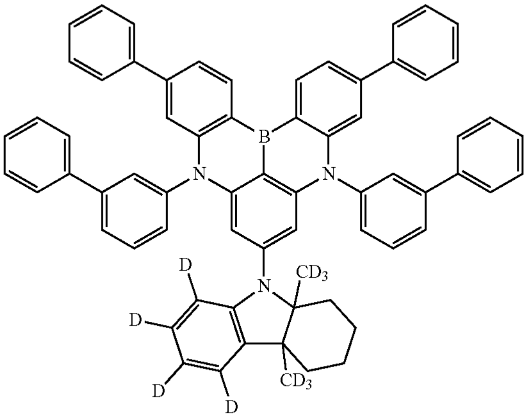
-continued
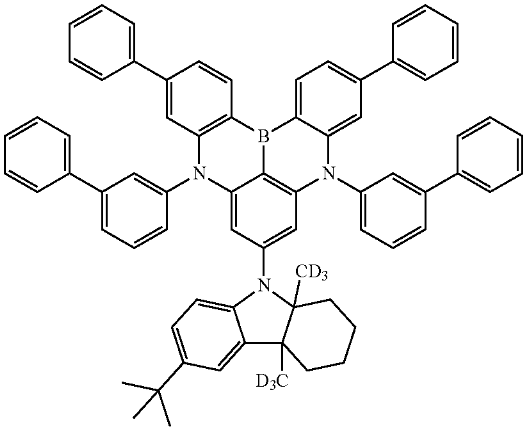
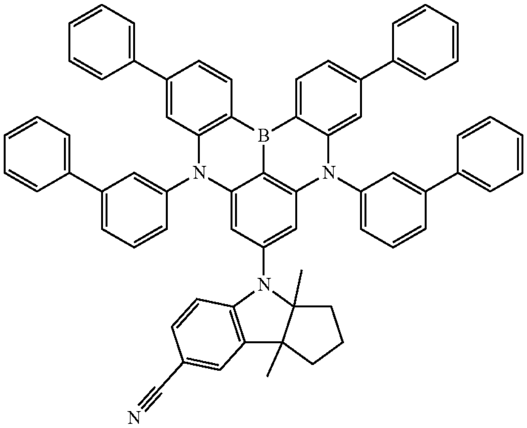
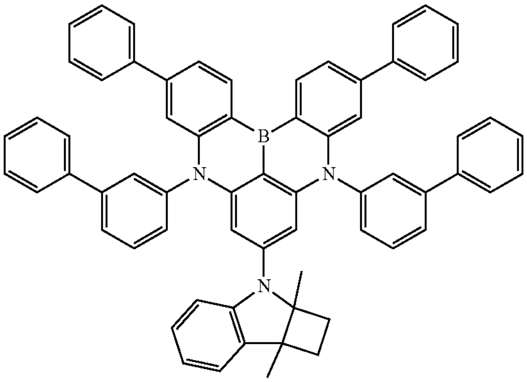
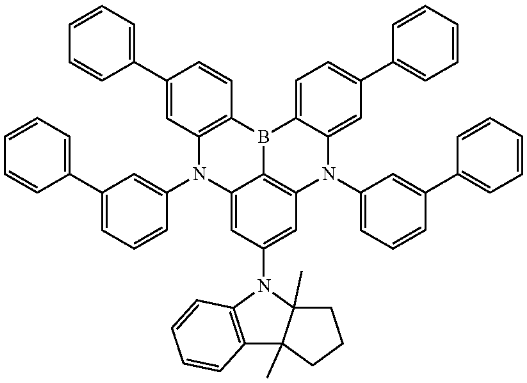

-continued
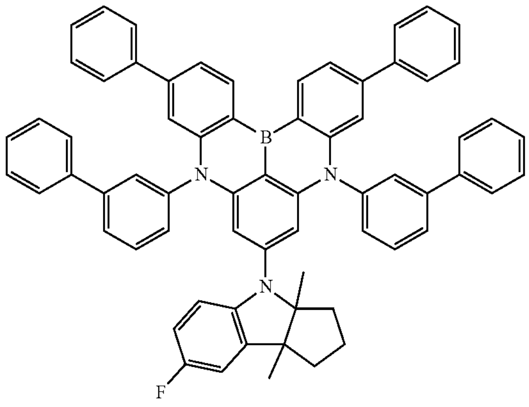
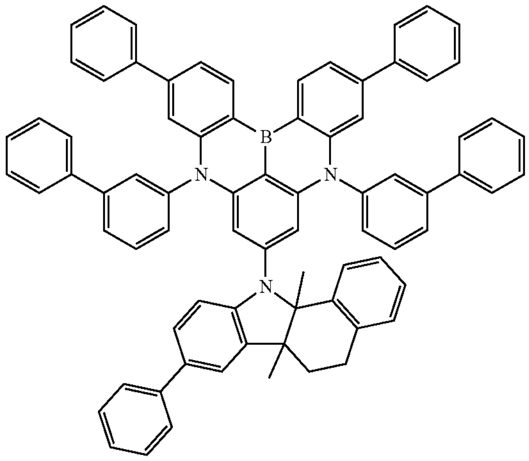
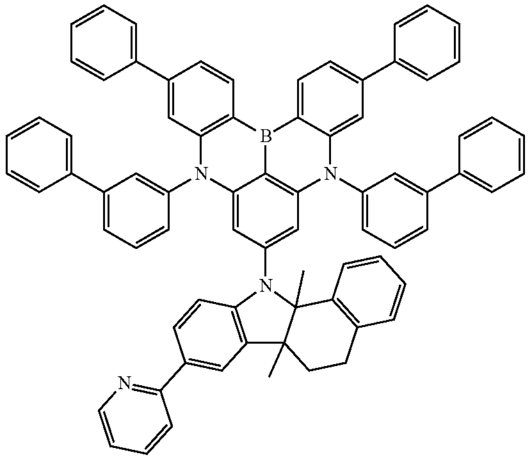
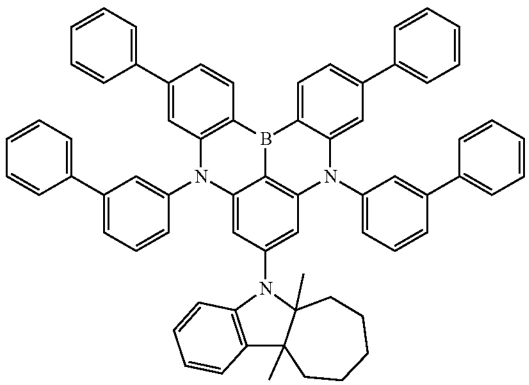
-continued
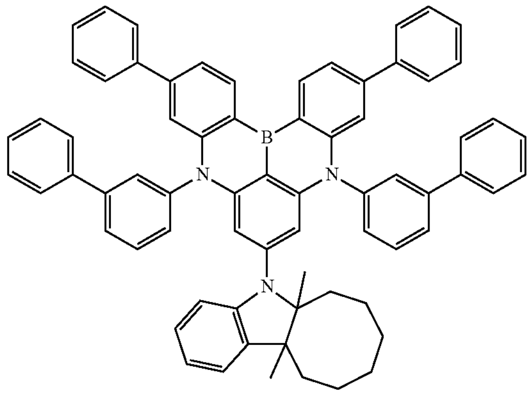
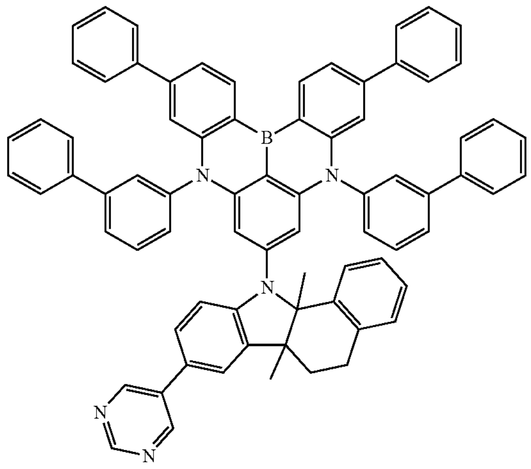
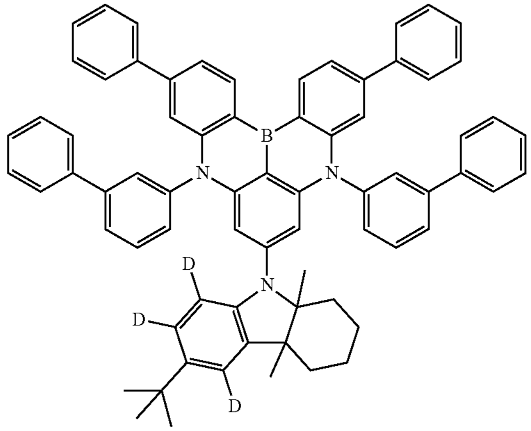
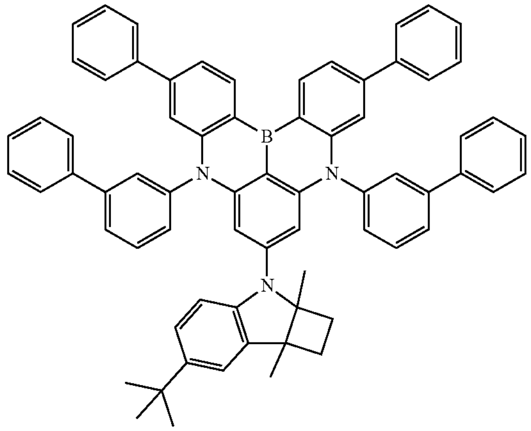

-continued
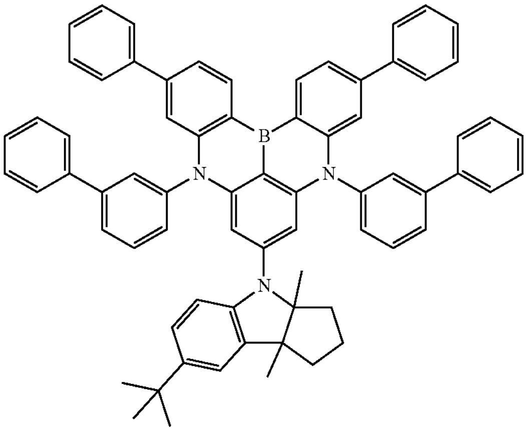
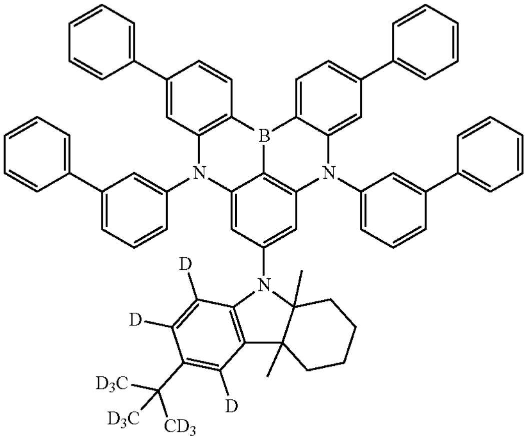
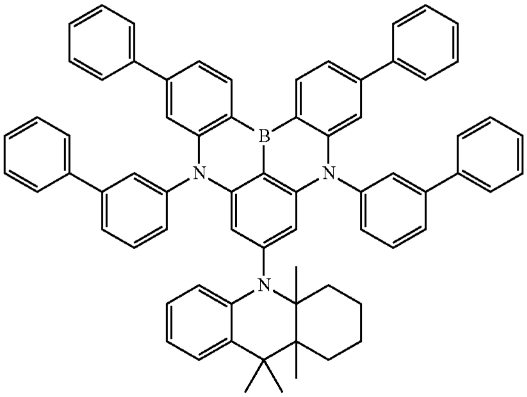
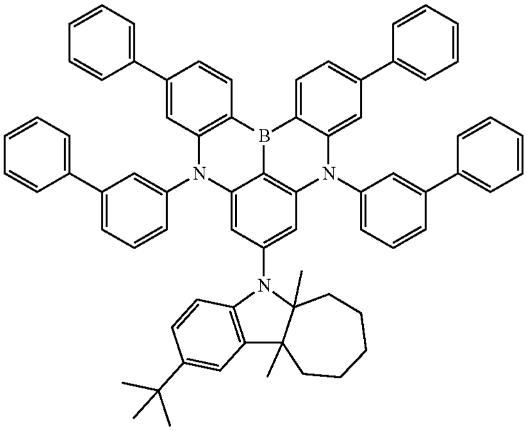
-continued
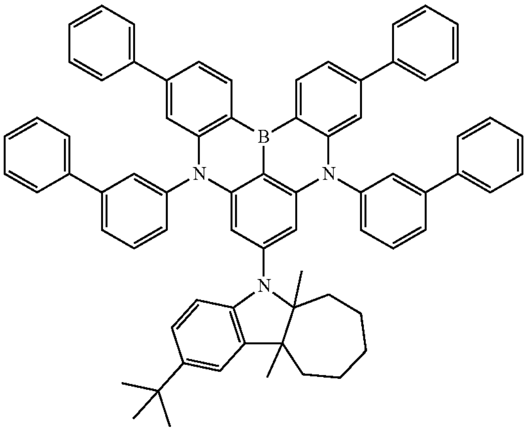
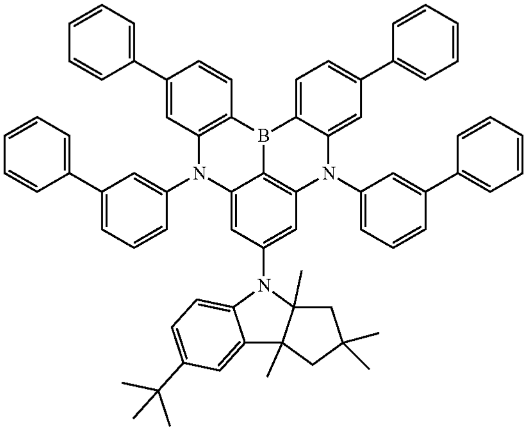
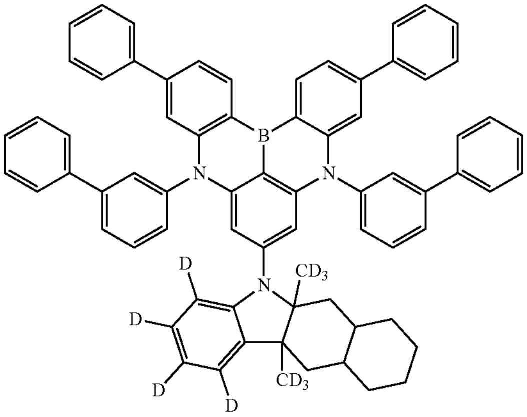
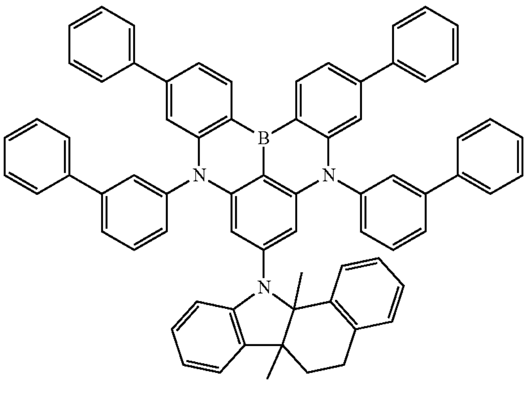

-continued
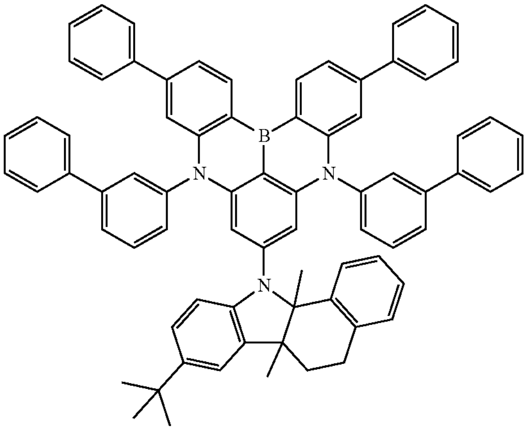
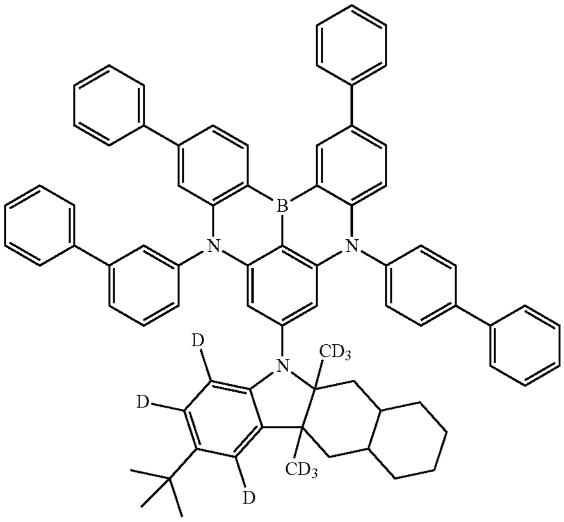
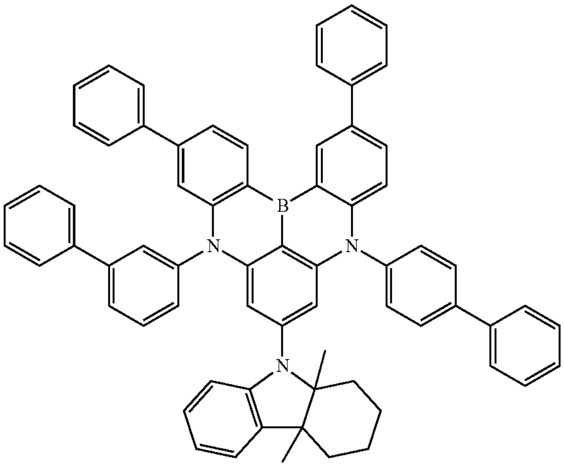
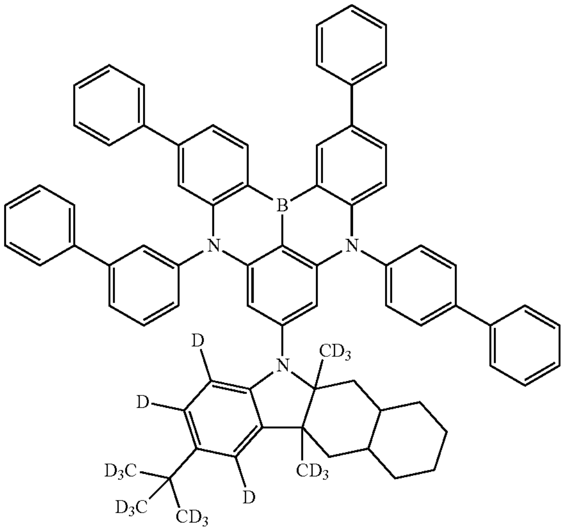
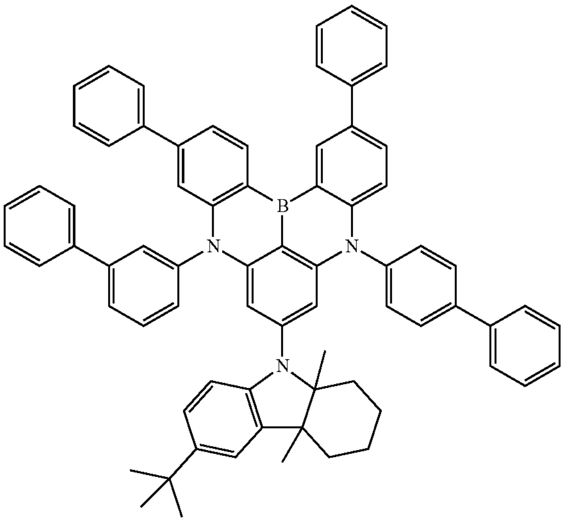
-continued
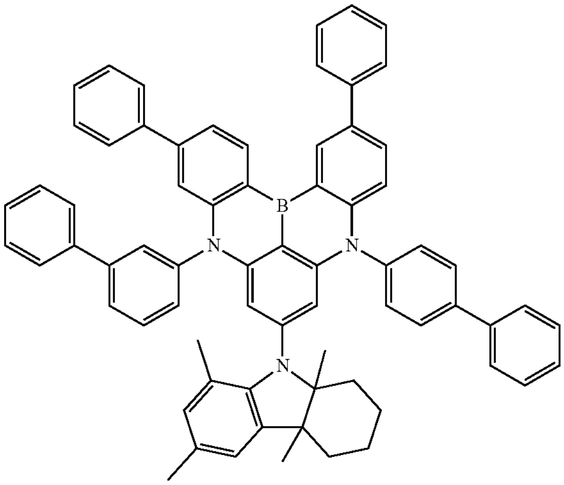

-continued
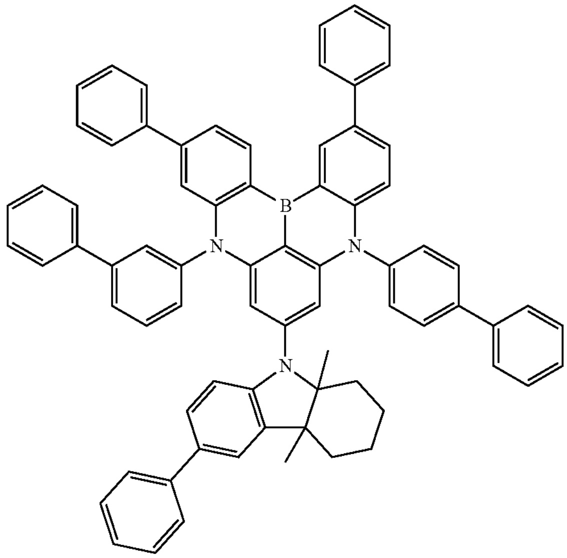
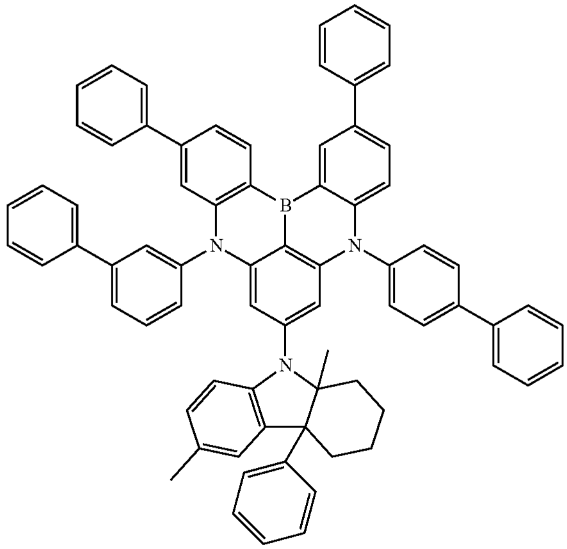
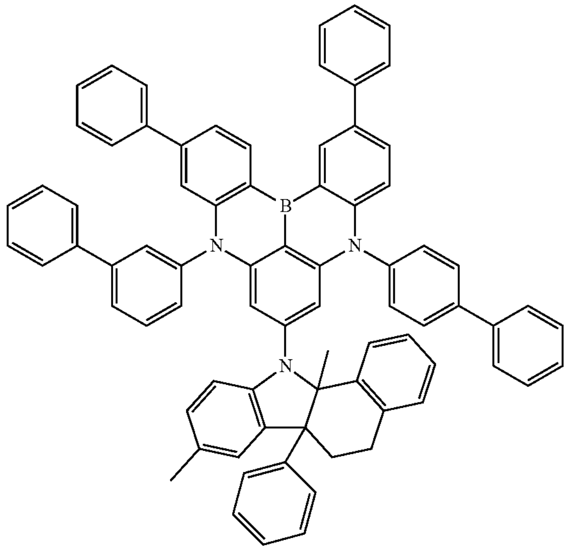
-continued
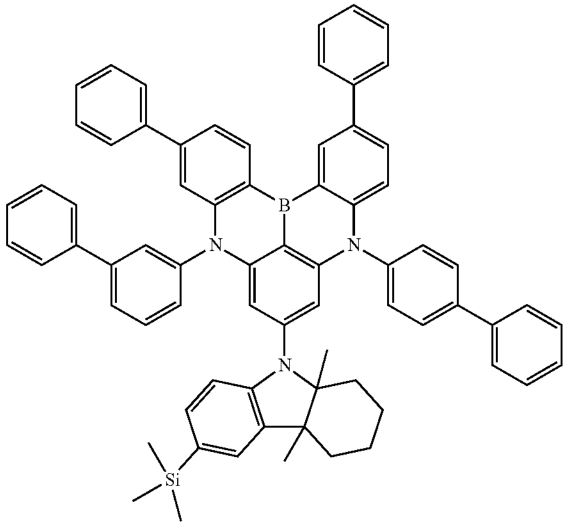
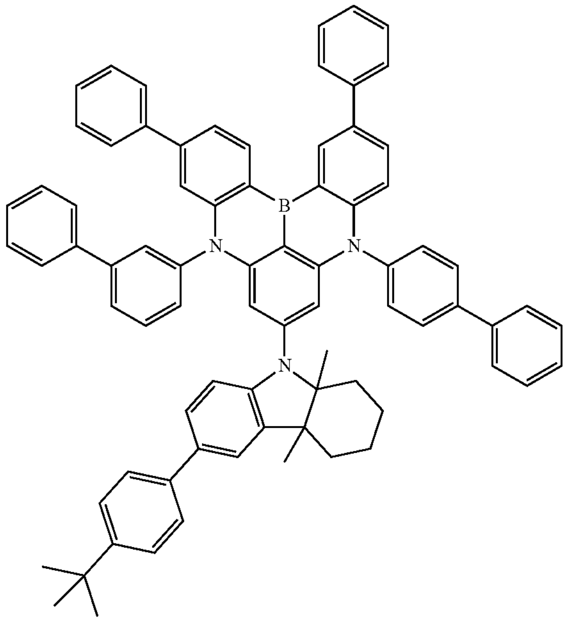
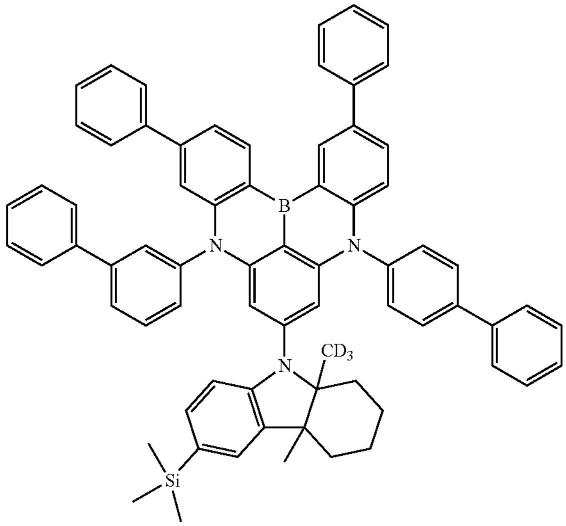

-continued
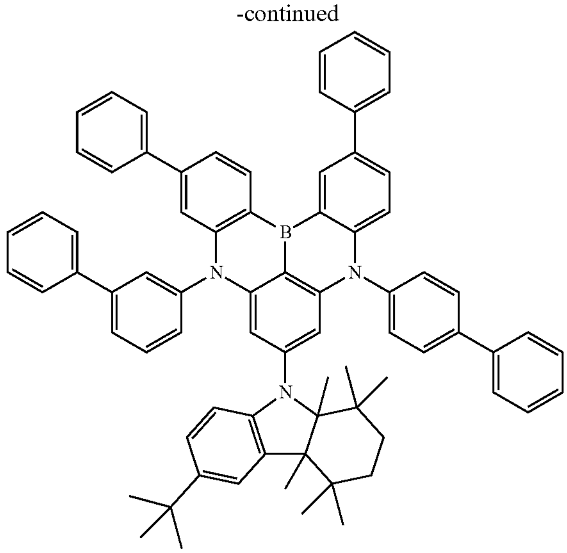
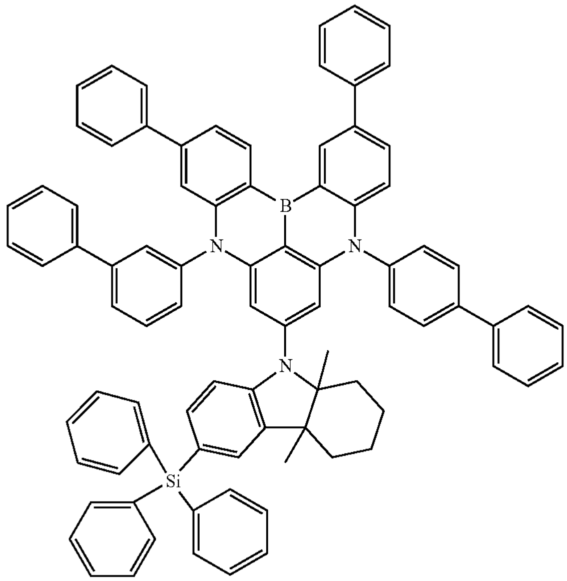
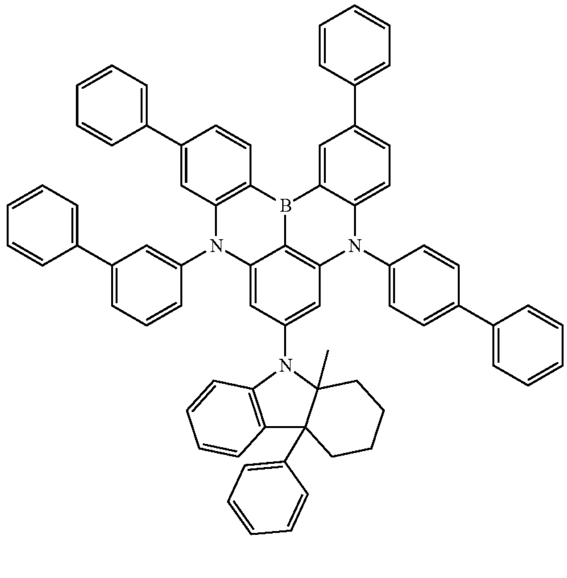
-continued
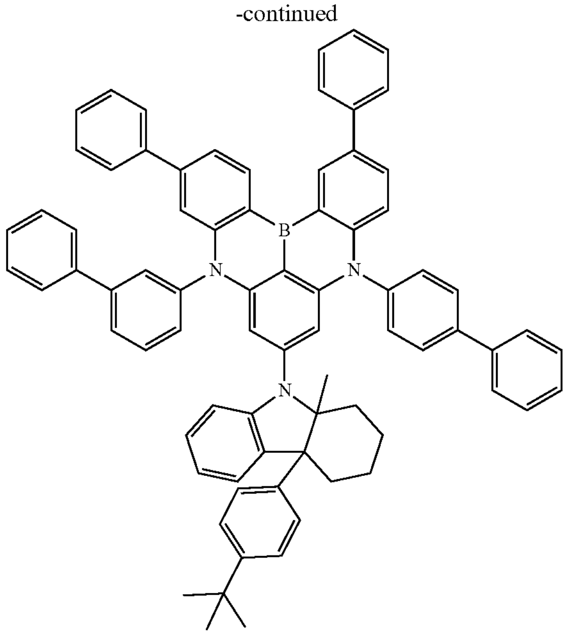
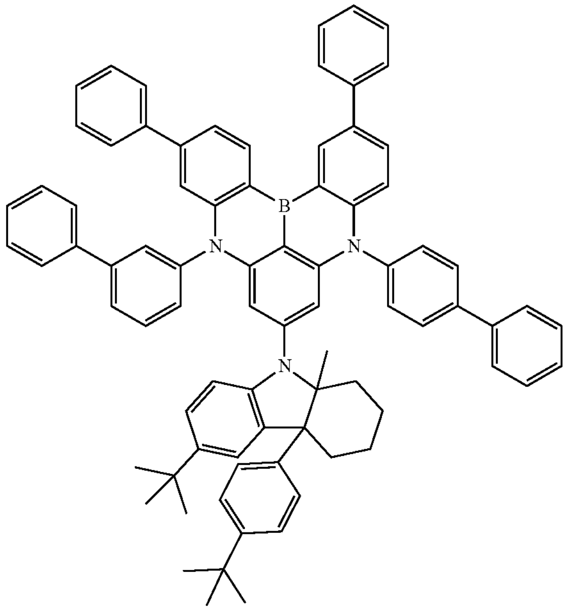

-continued
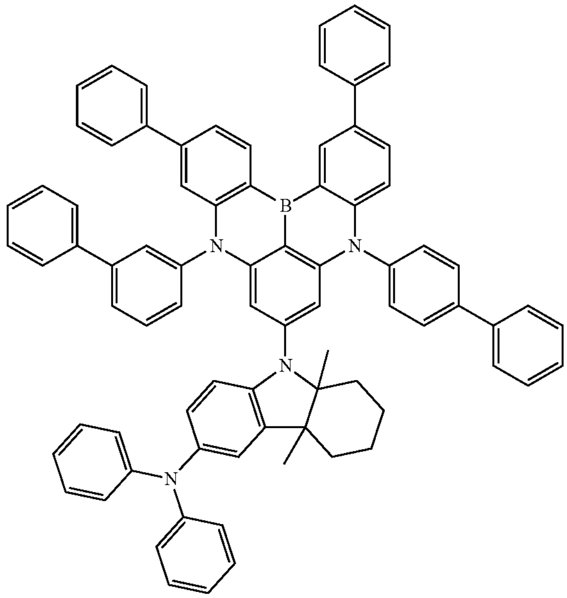
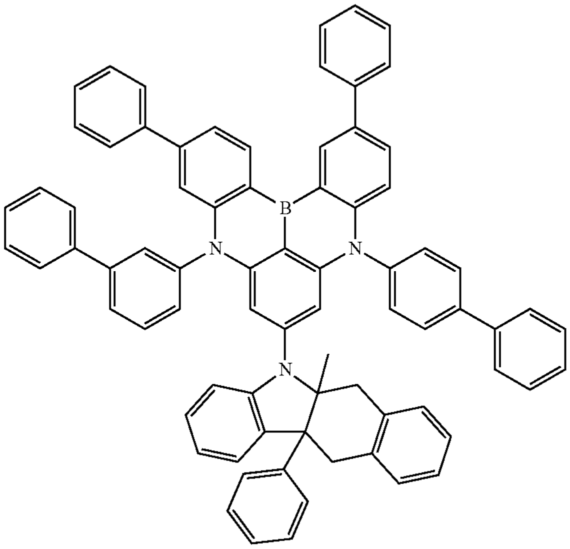
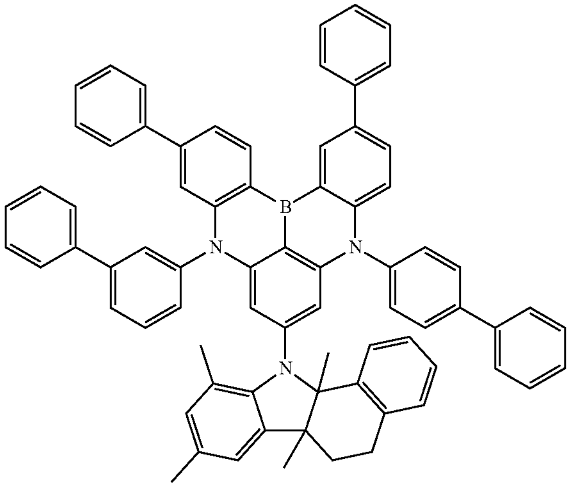
-continued
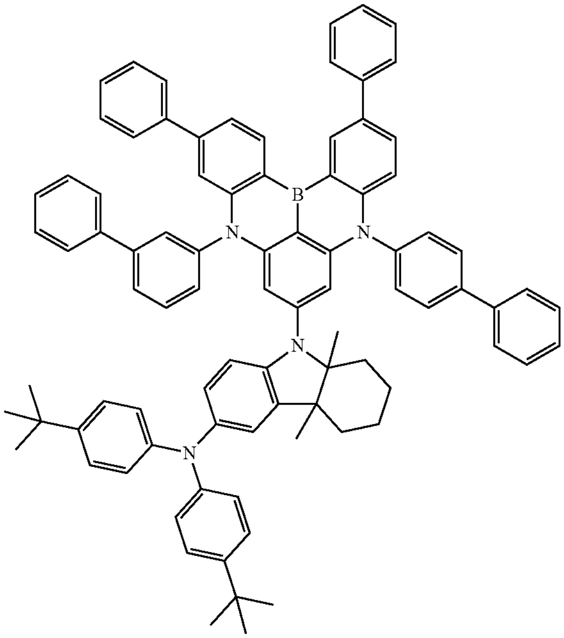
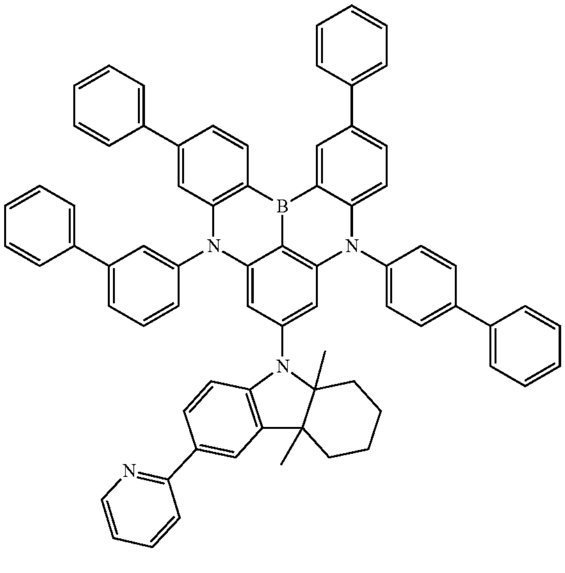

-continued
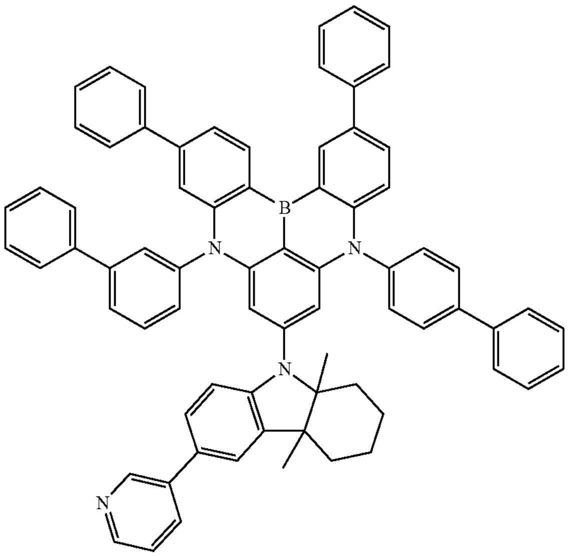
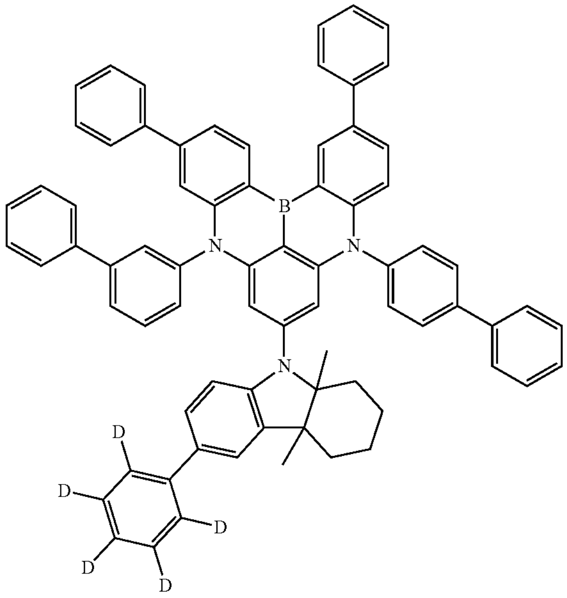
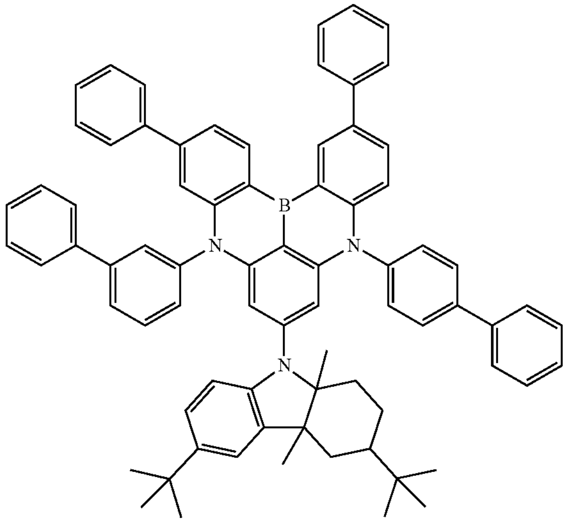
-continued
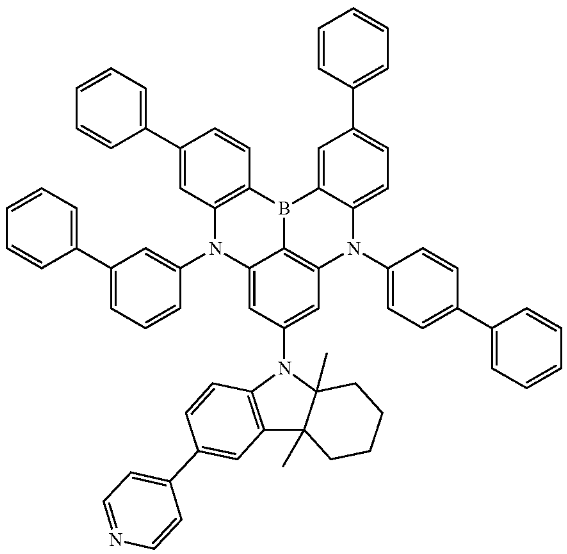
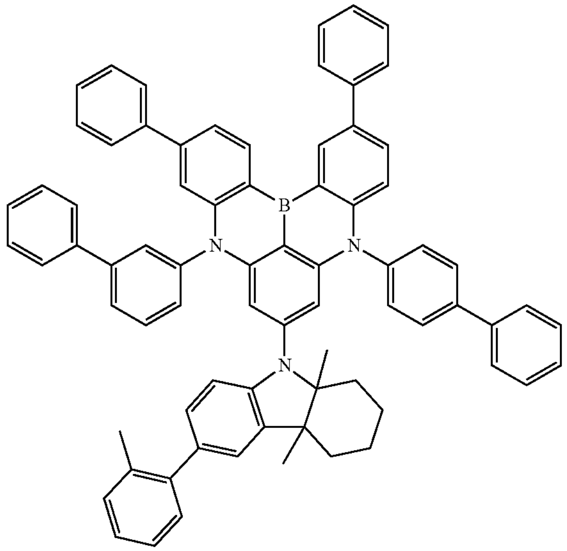
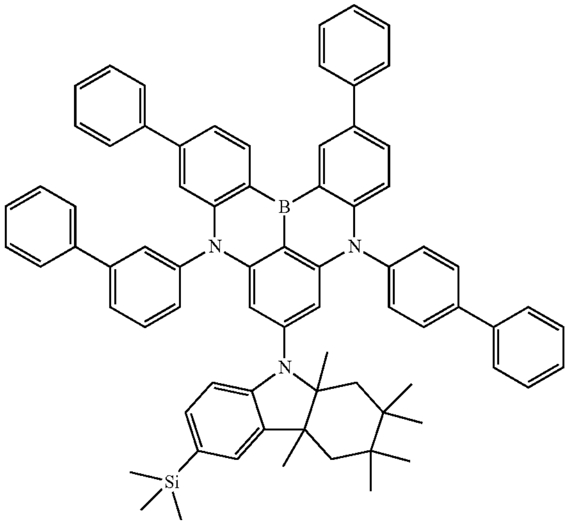

-continued
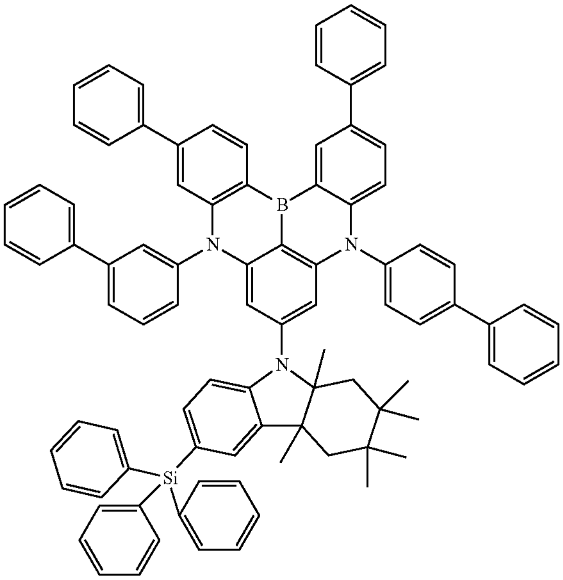
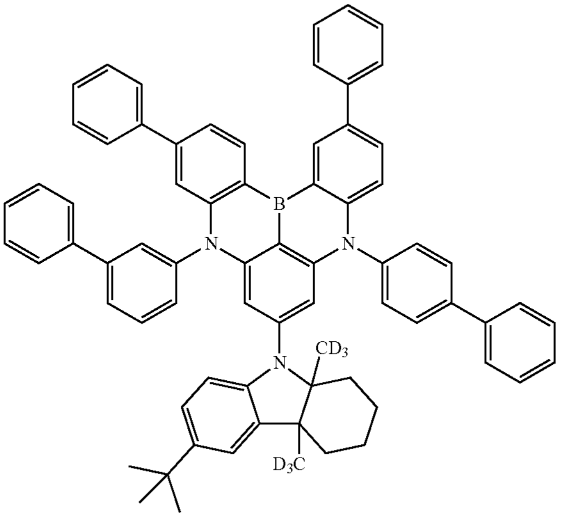
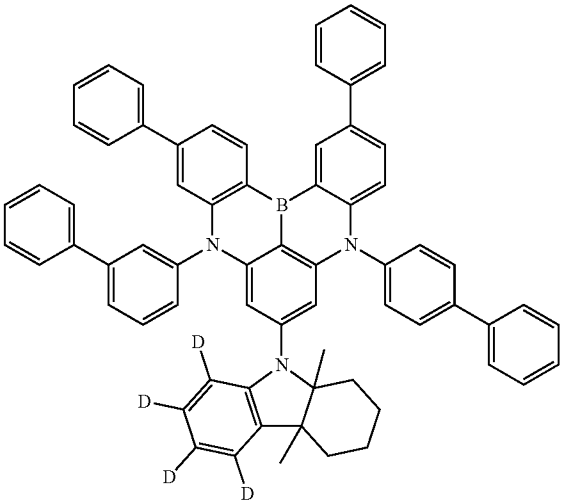
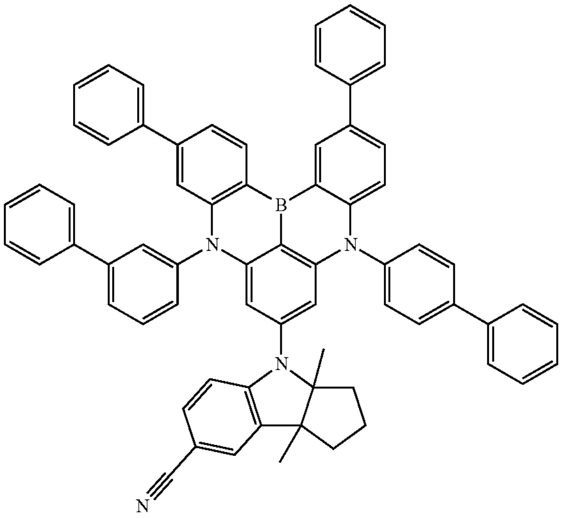
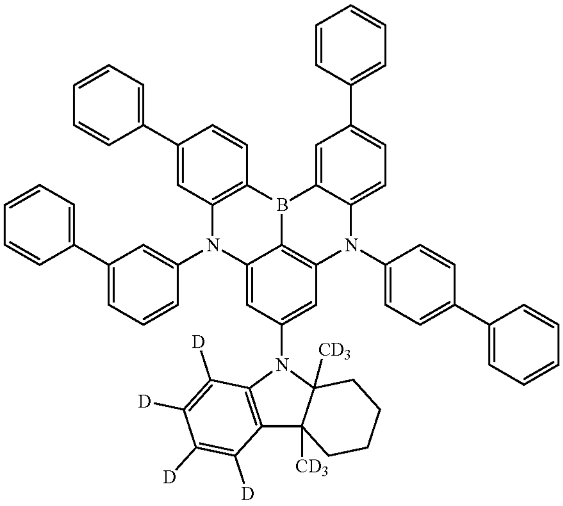
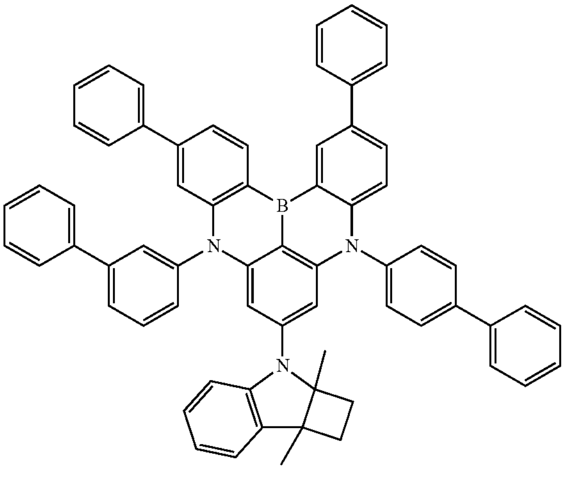
-continued -continued
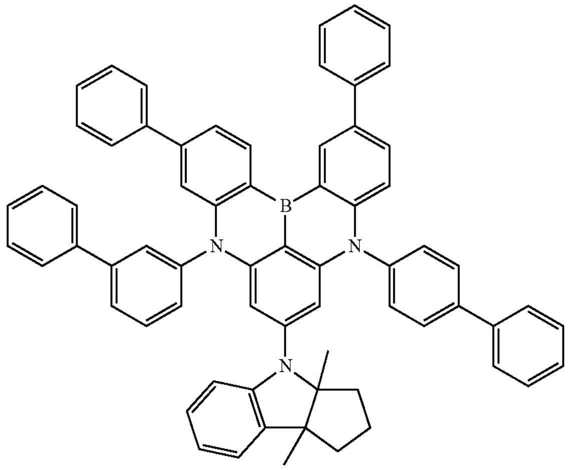
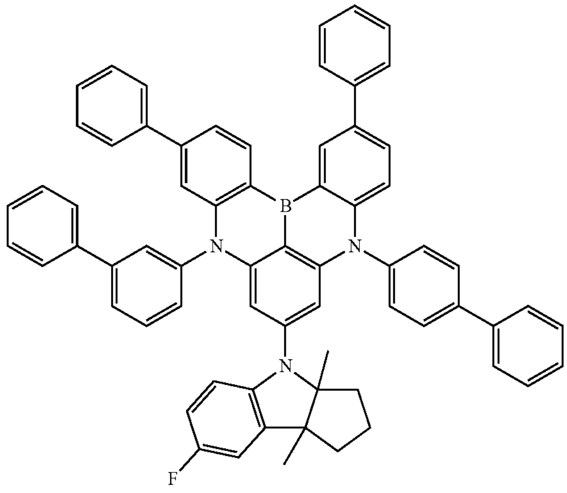
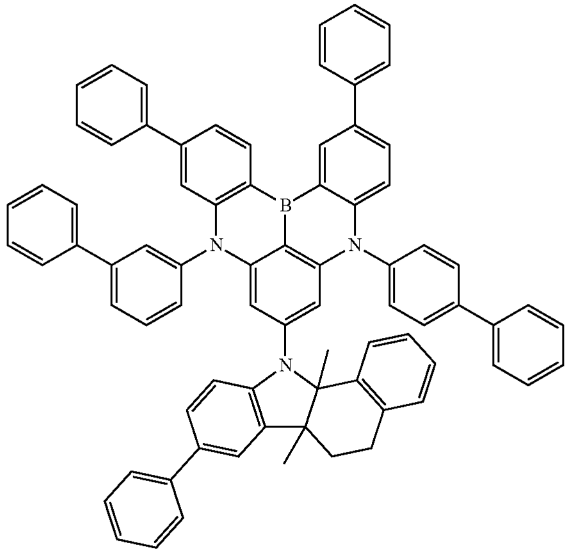
-continued
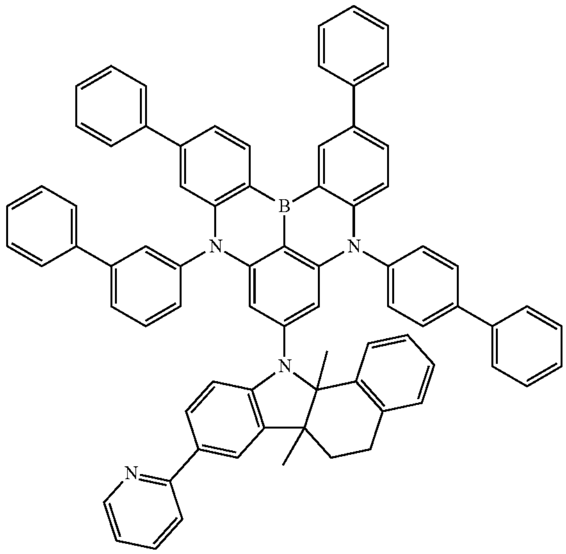
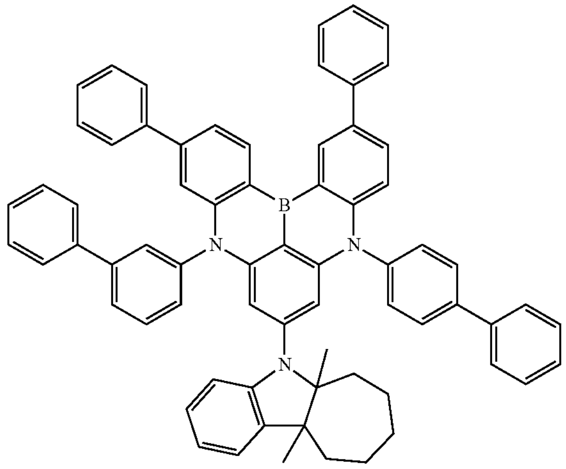
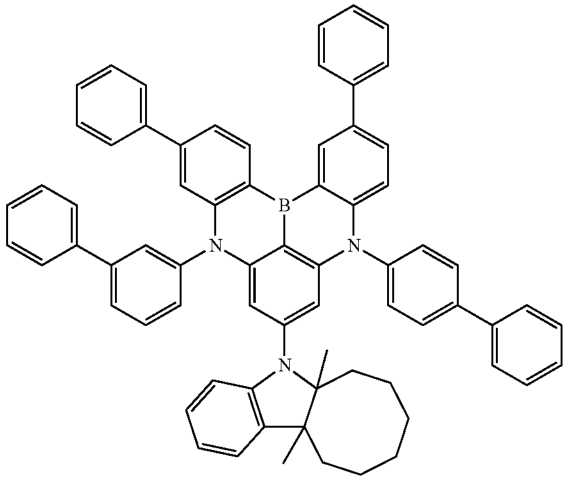

-continued
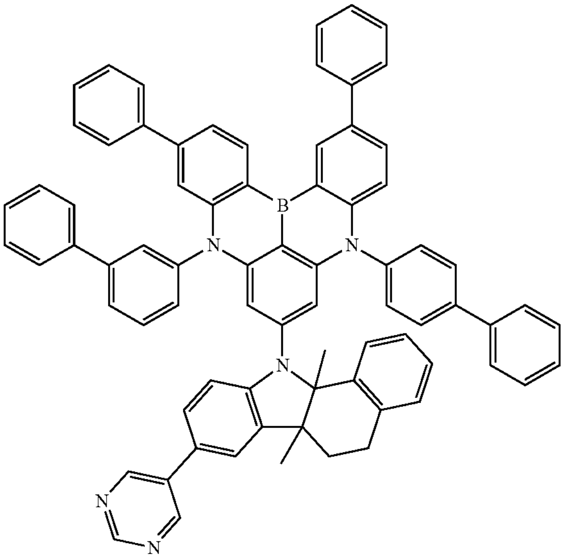
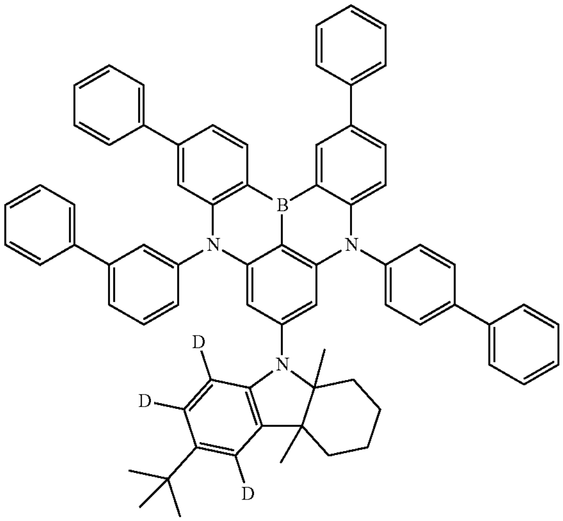
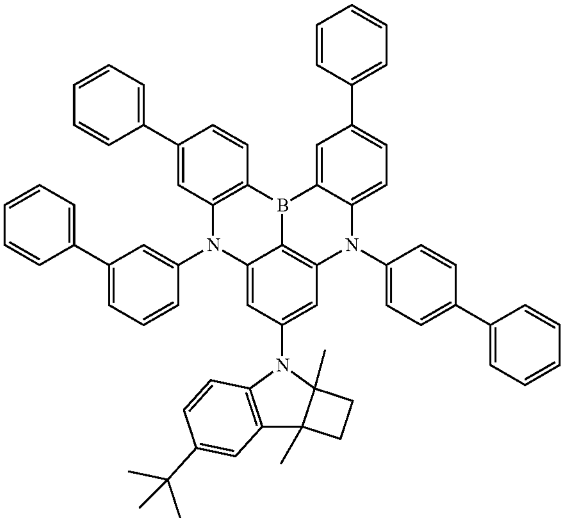
-continued
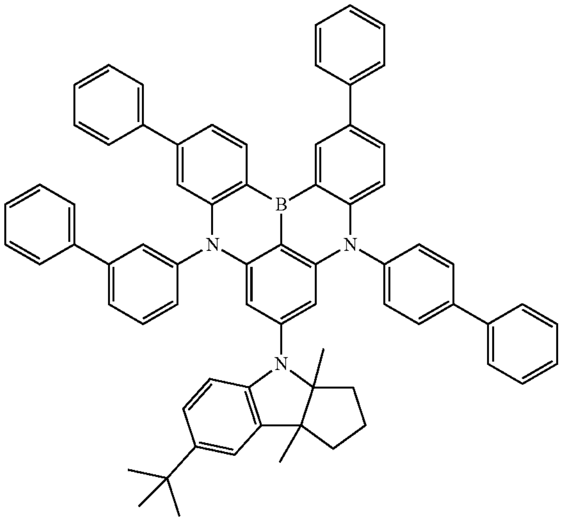
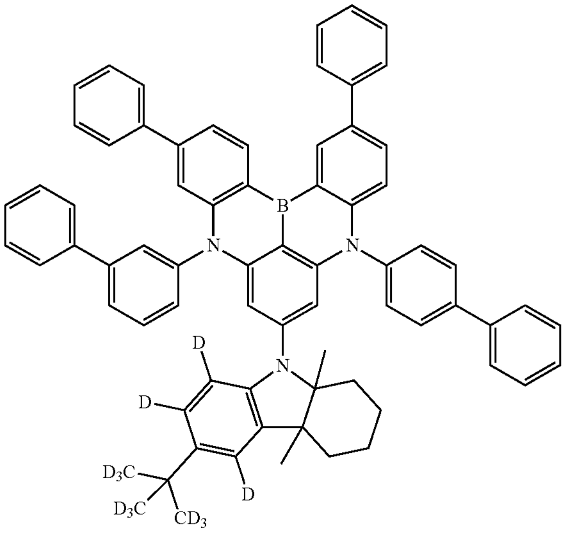
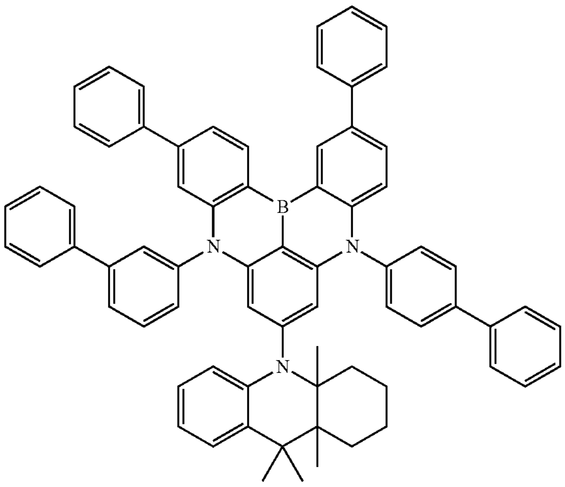

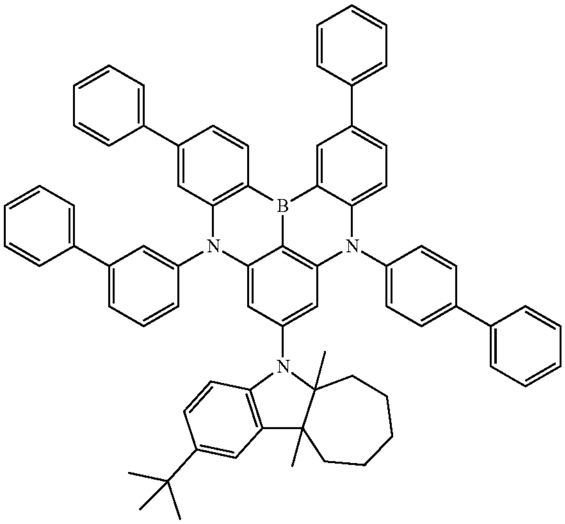
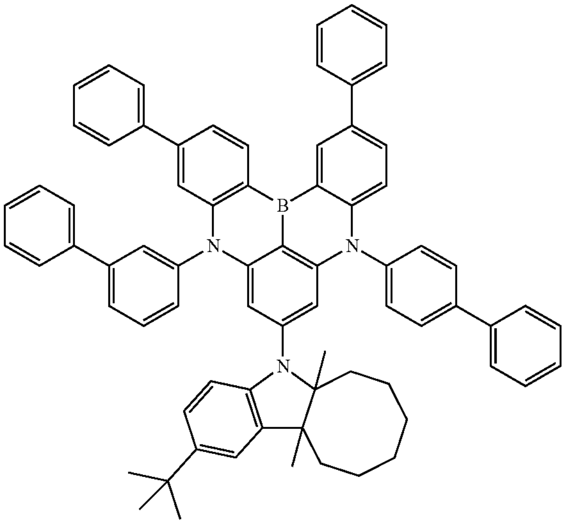
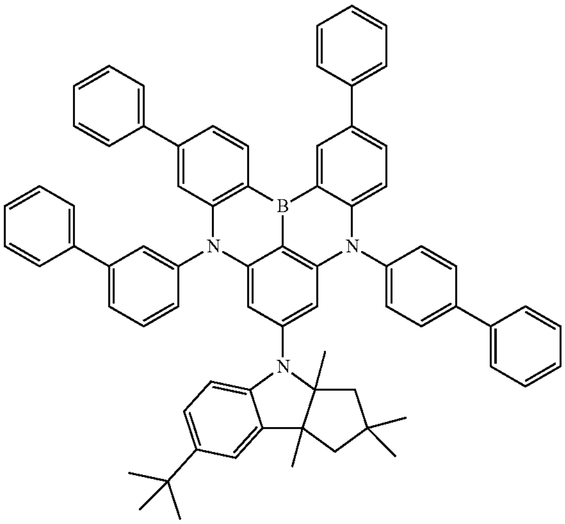
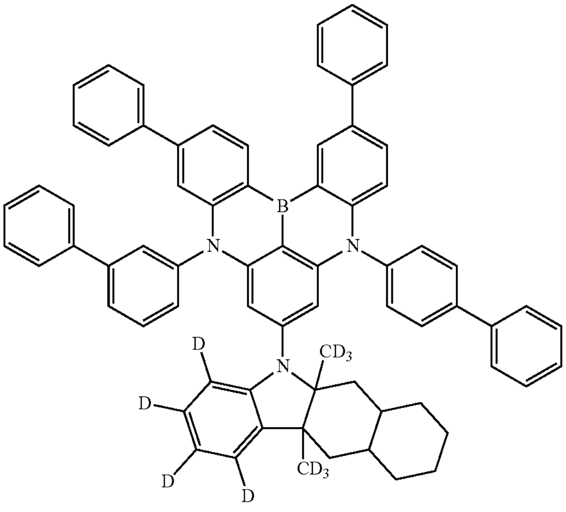
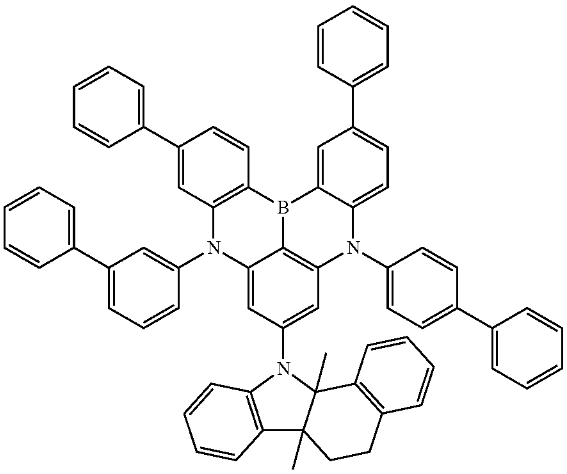
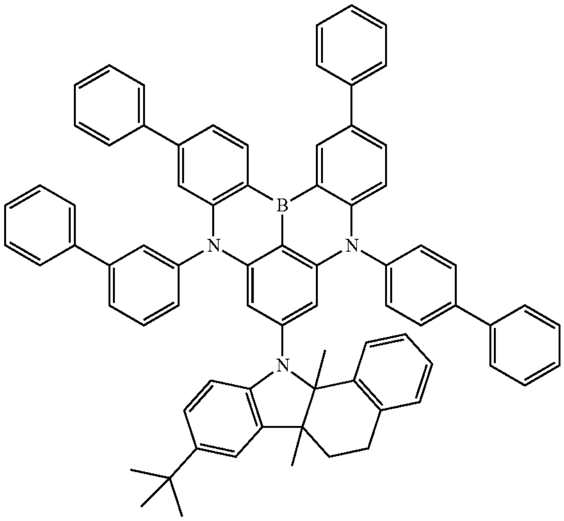

-continued
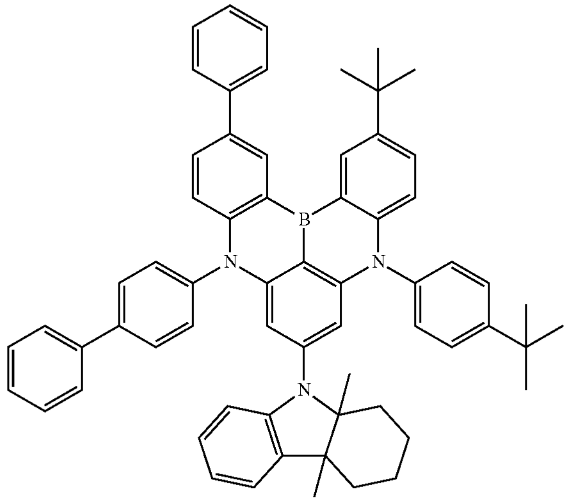
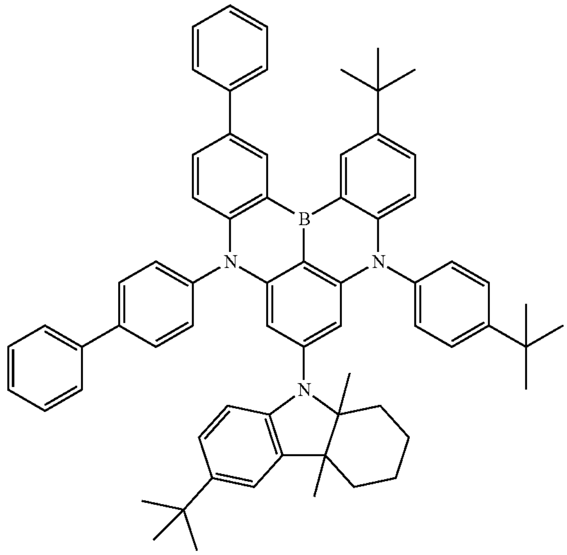
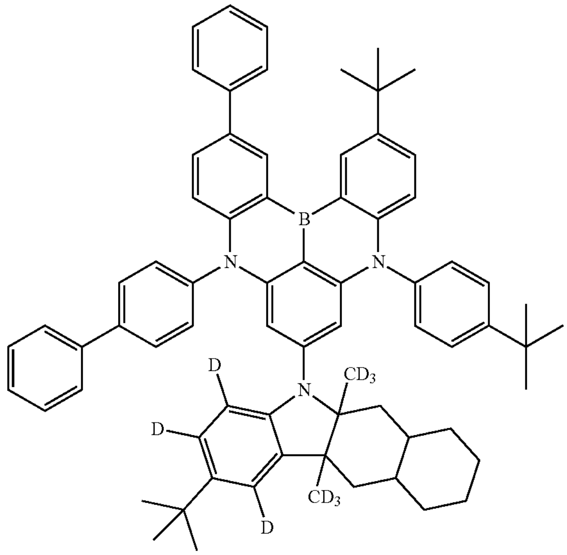
-continued
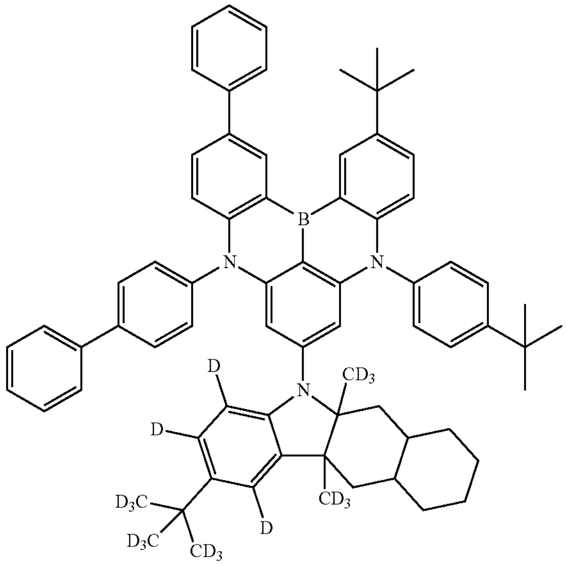
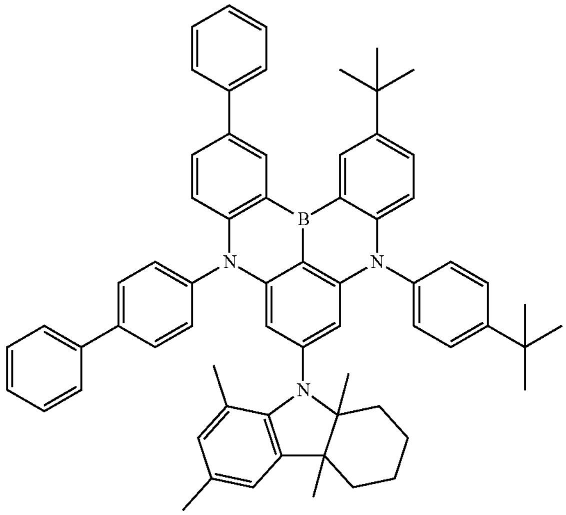
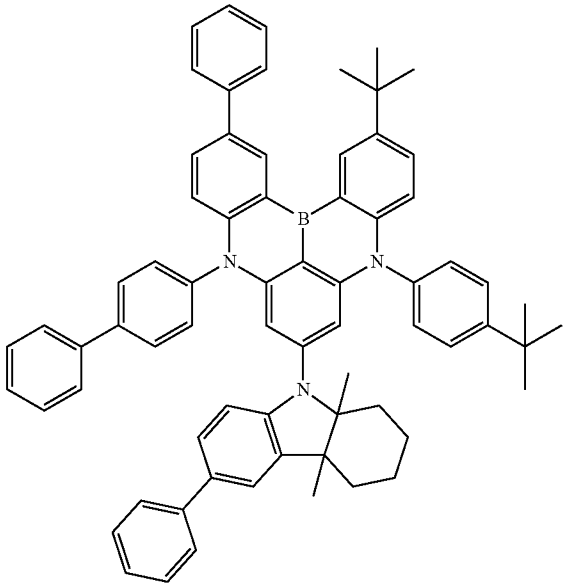

-continued
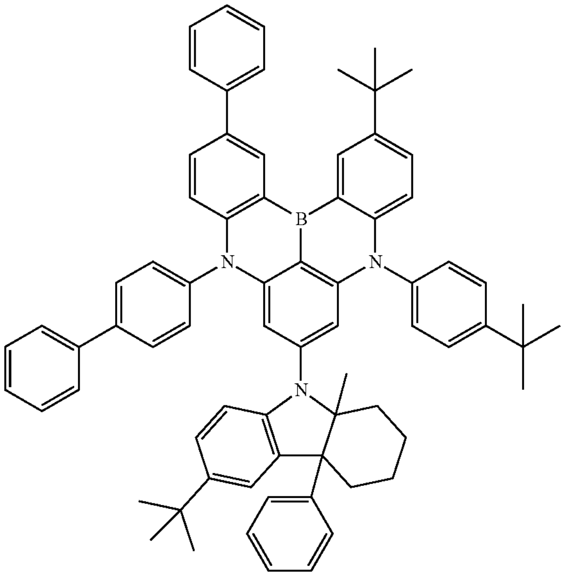
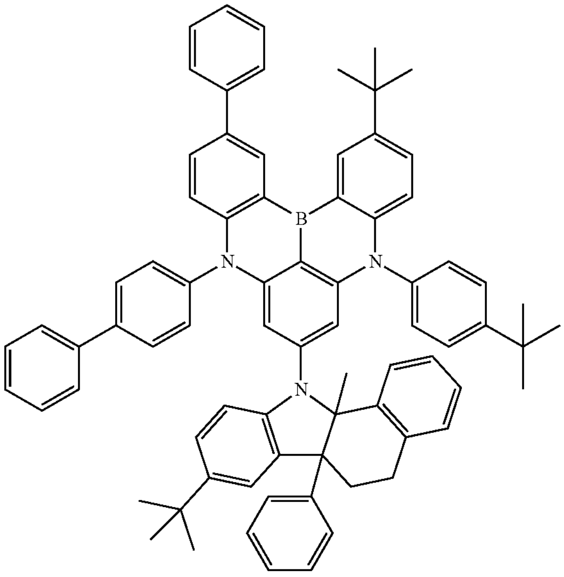
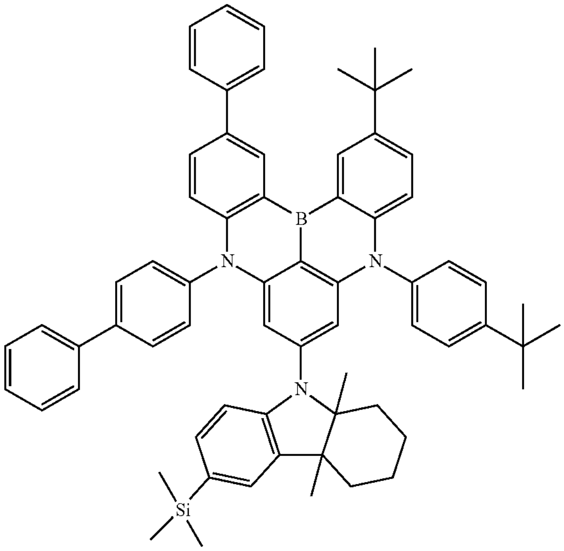
-continued
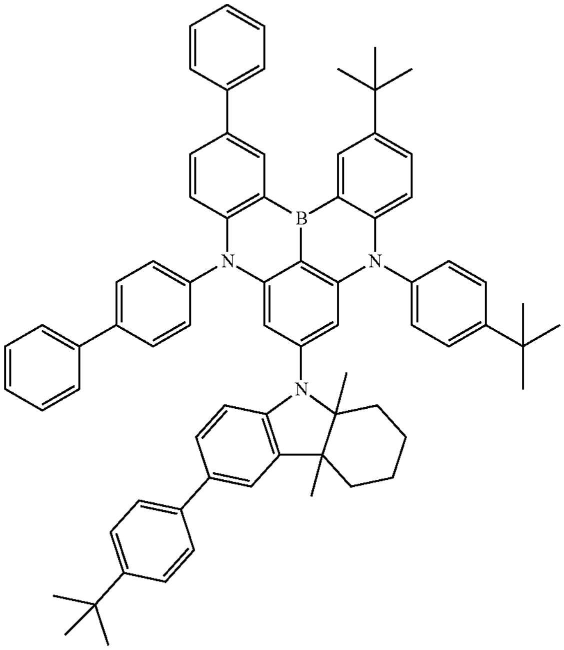
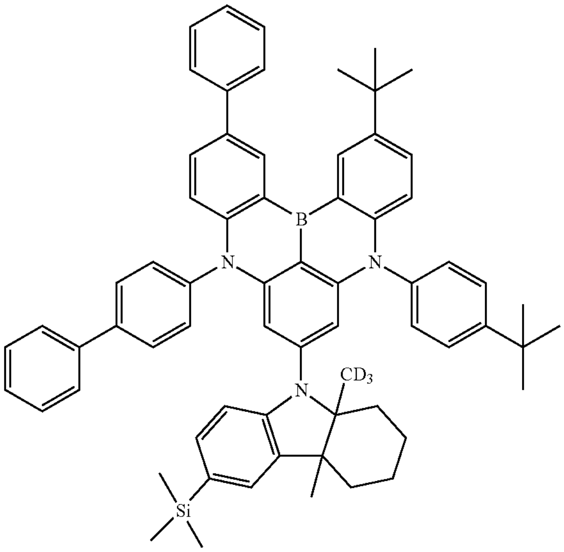

-continued
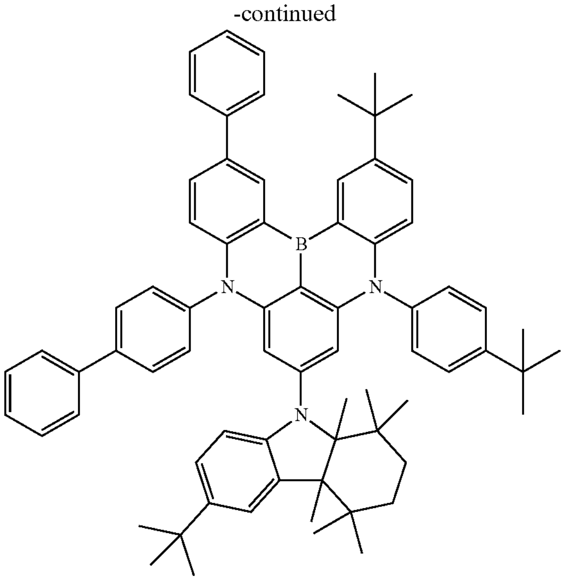
-continued
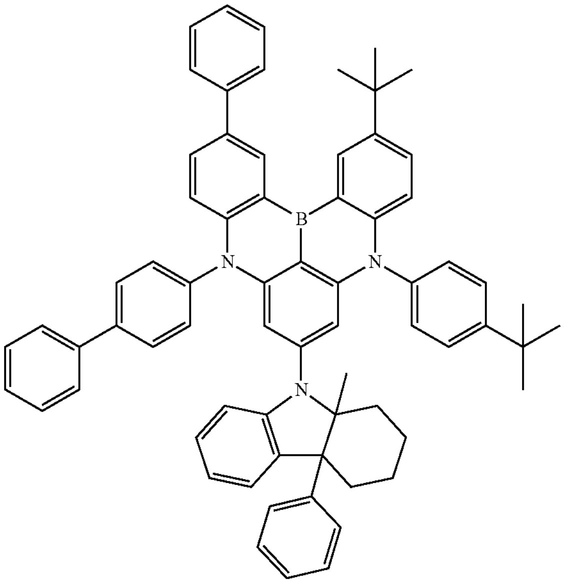
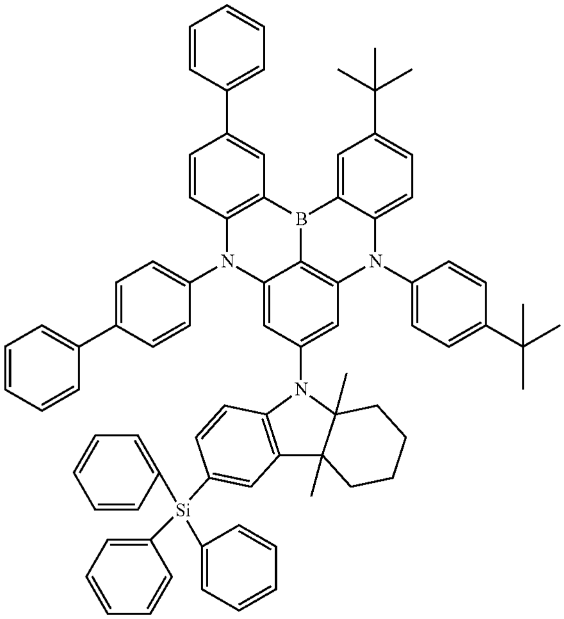
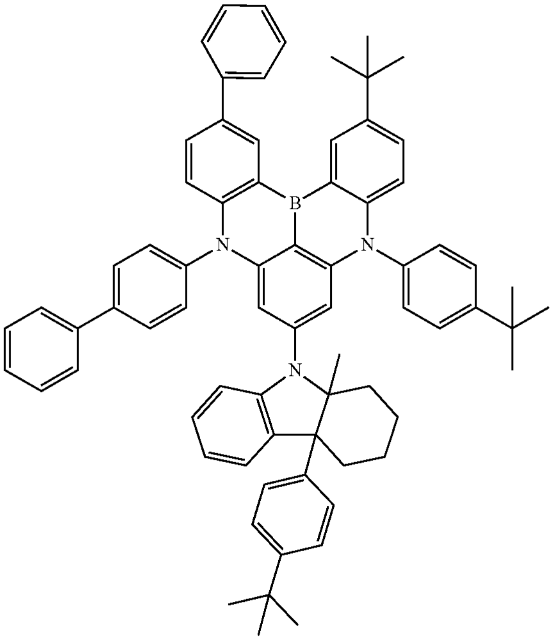

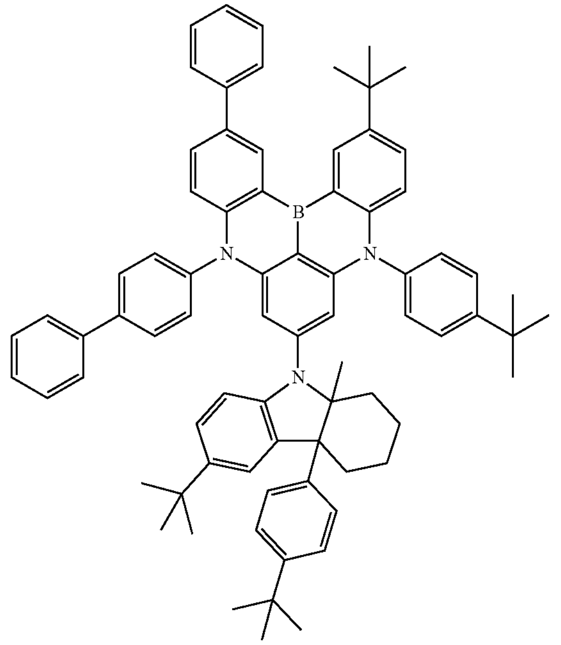
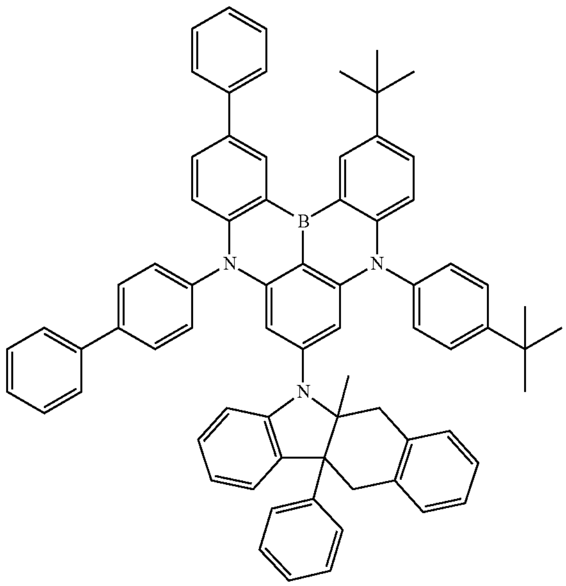
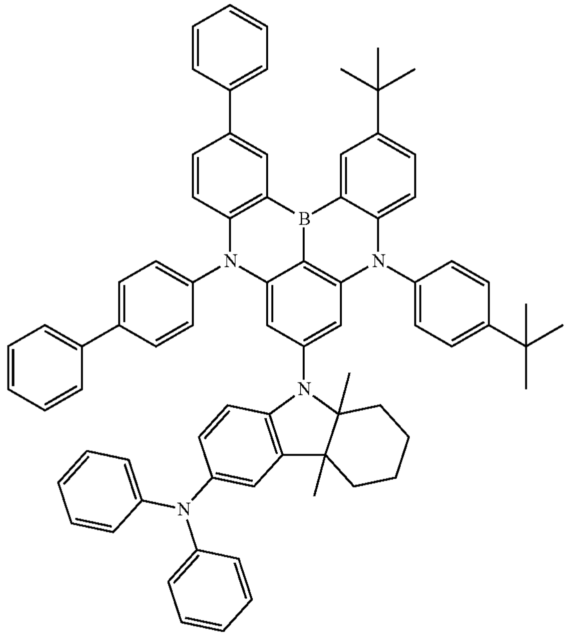
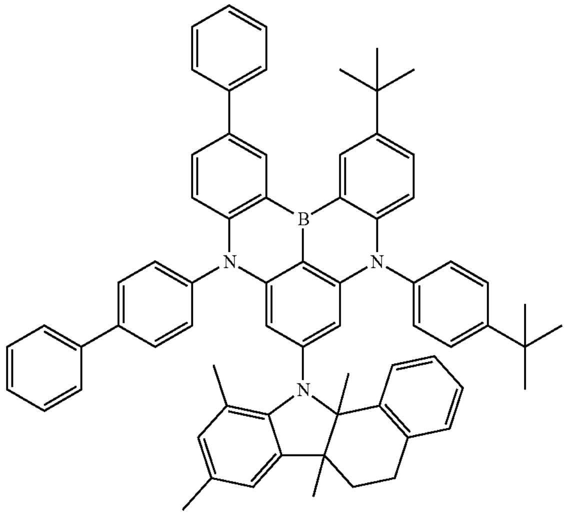

-continued
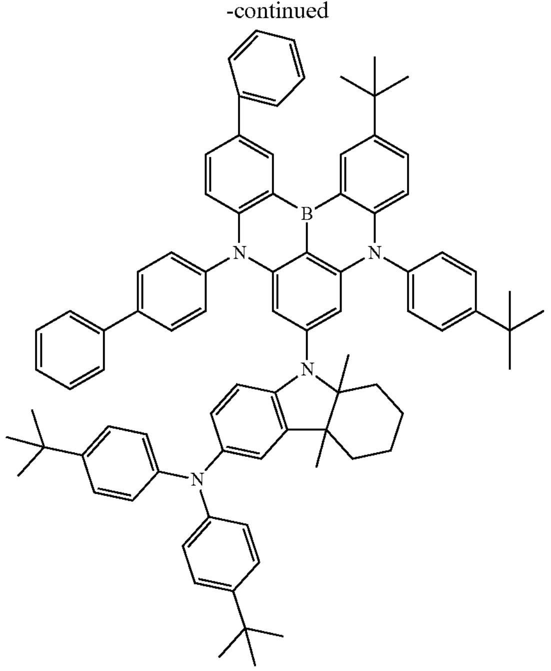
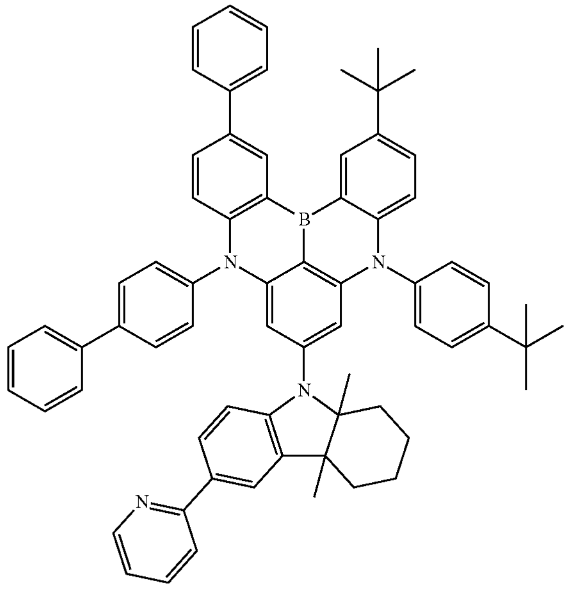
-continued
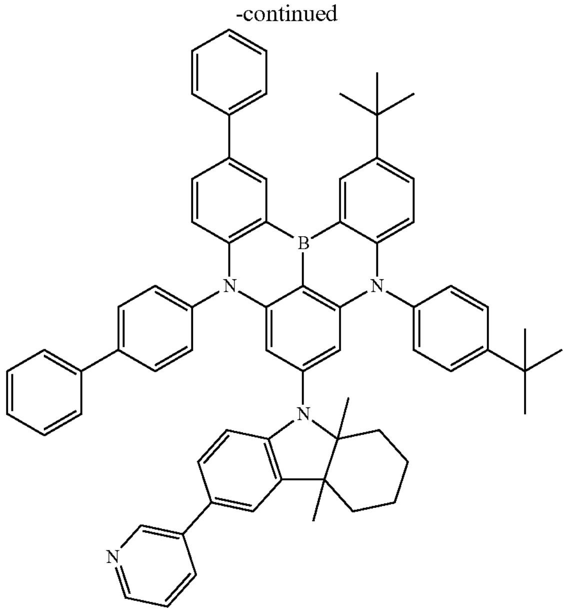
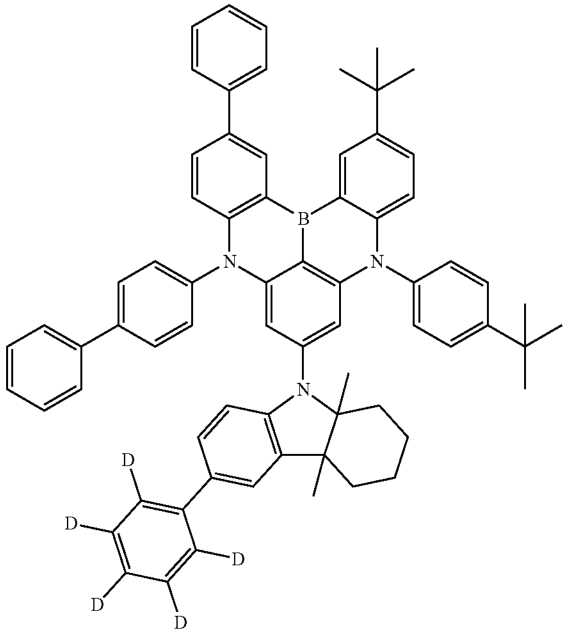

-continued
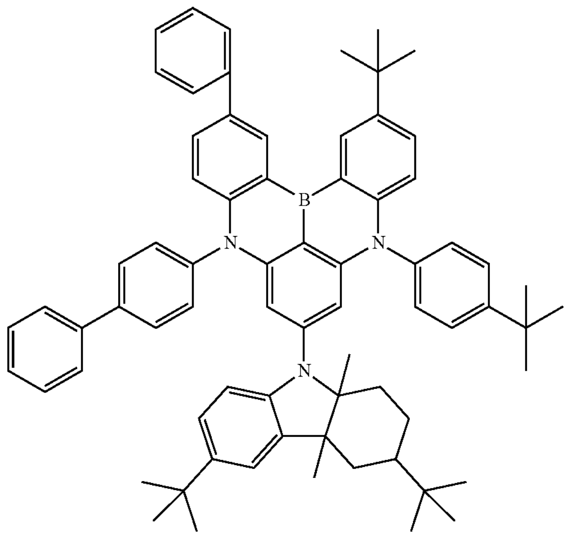
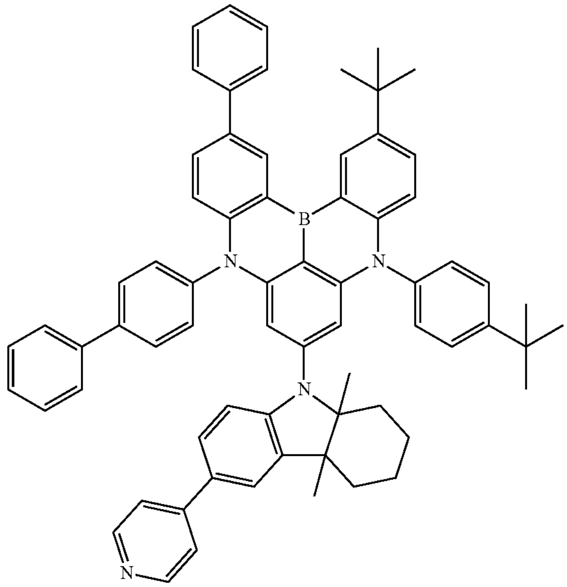
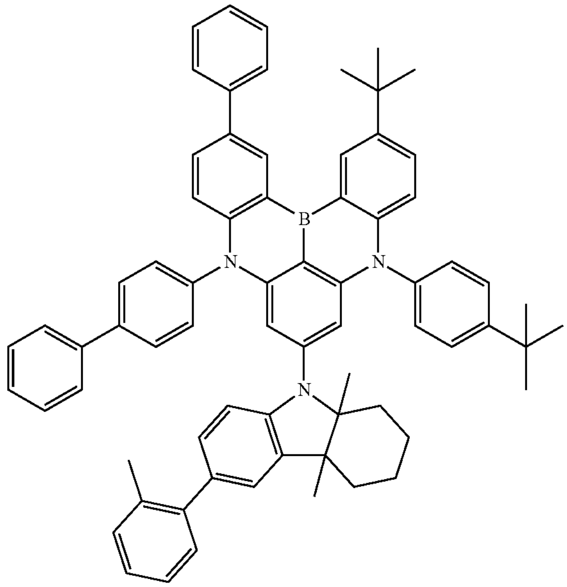
-continued
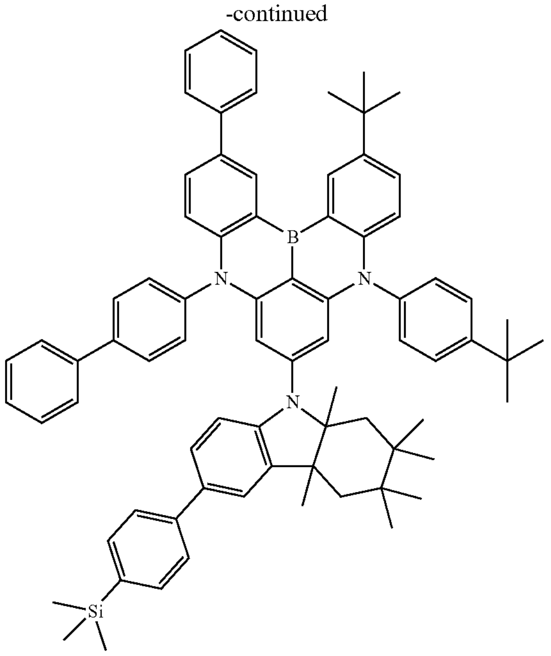
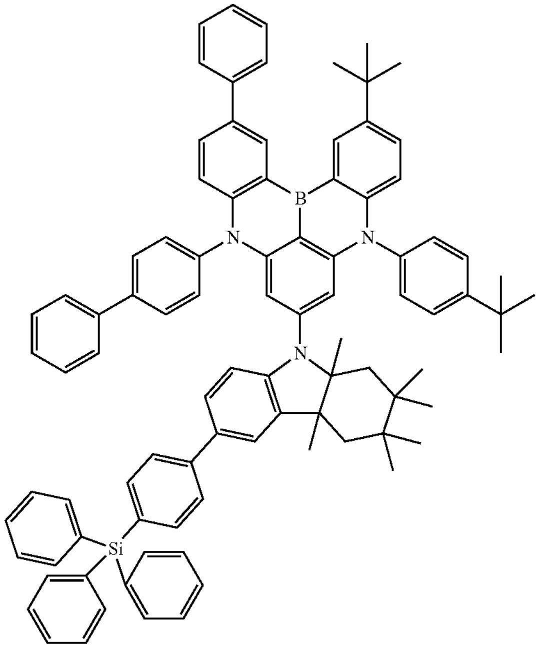

-continued
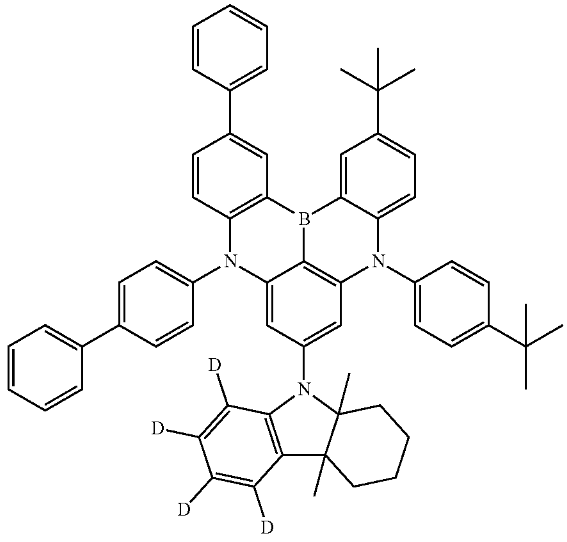
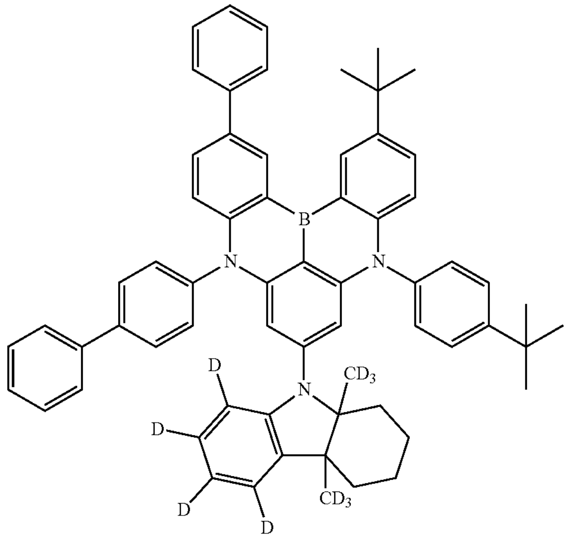
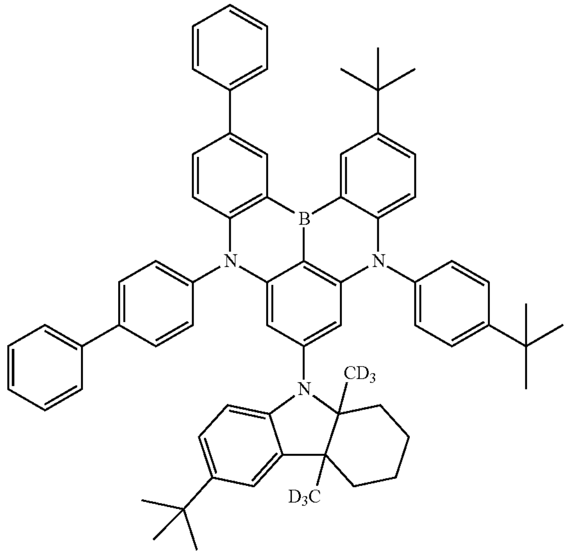
-continued
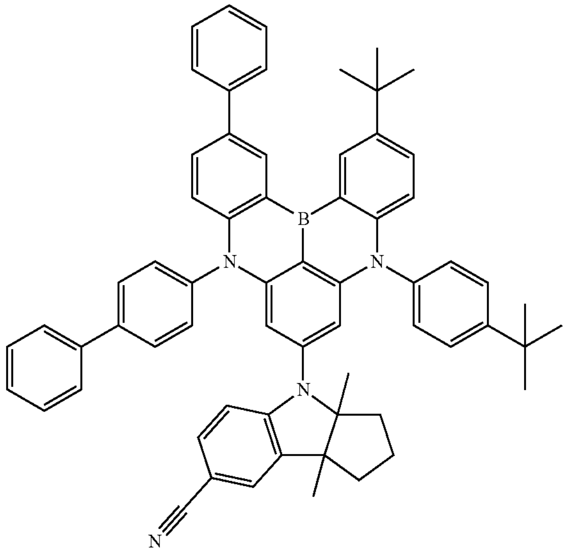
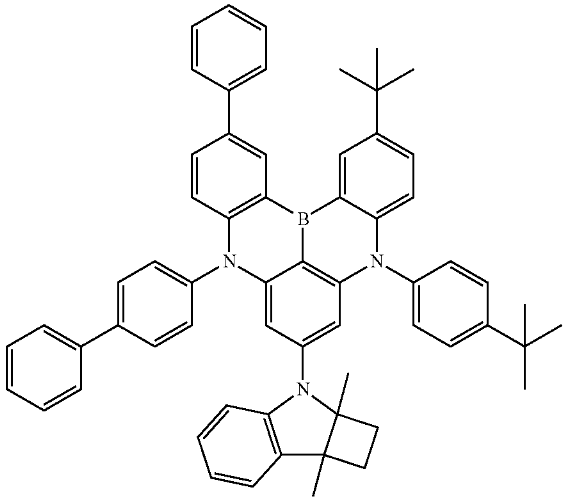
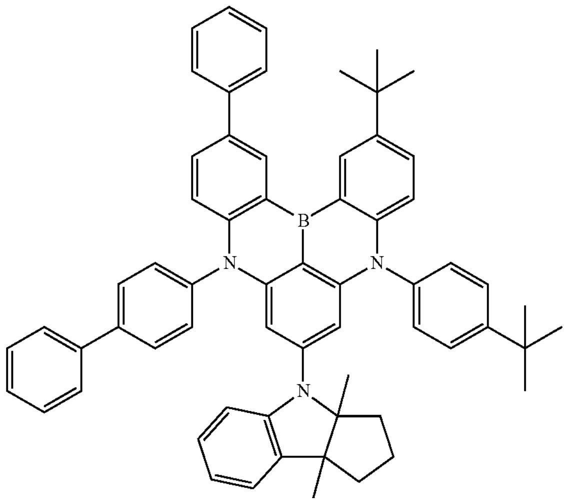

-continued
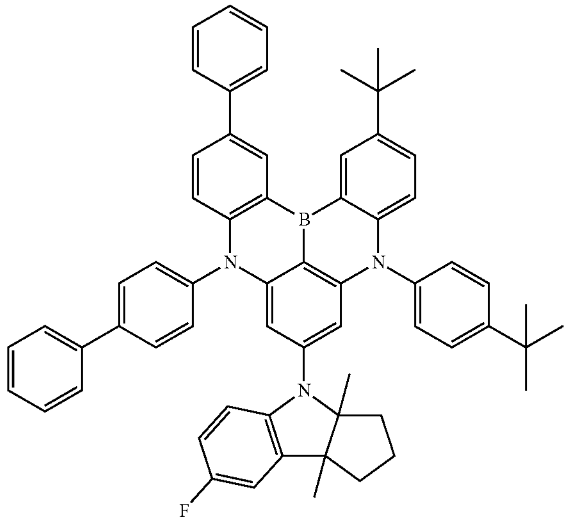
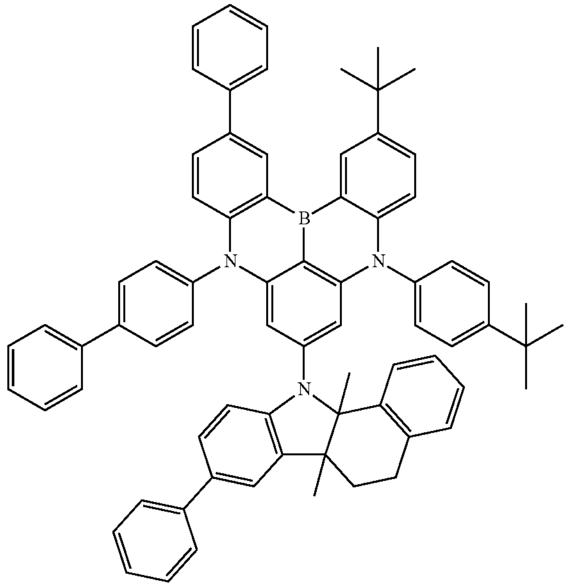
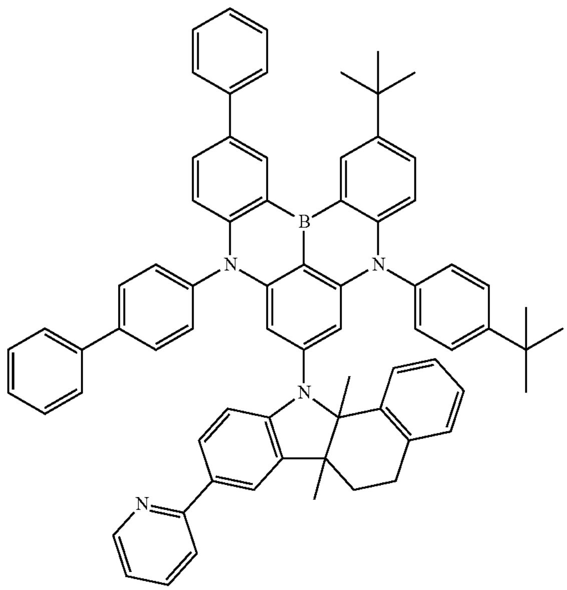
-continued
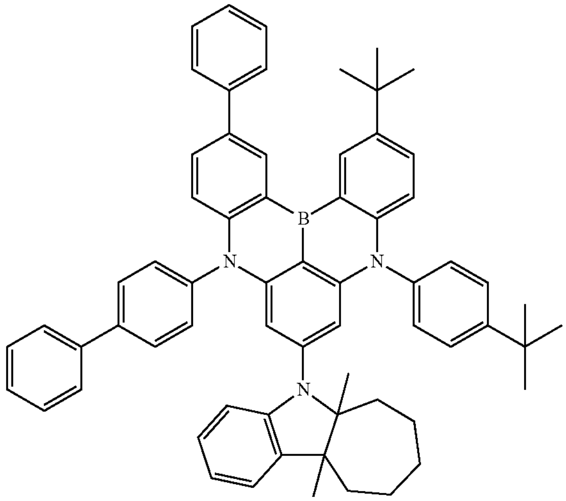
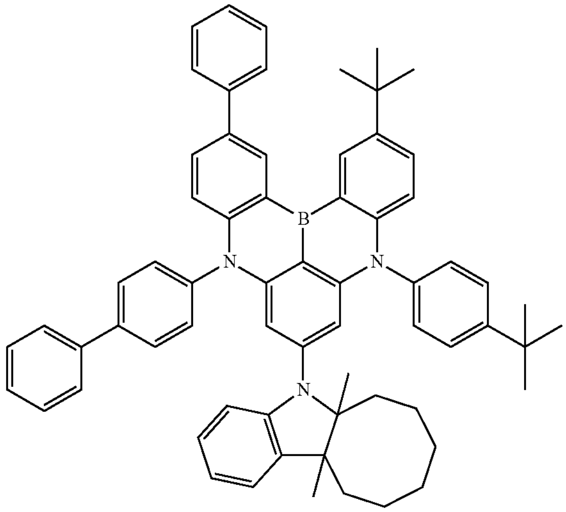
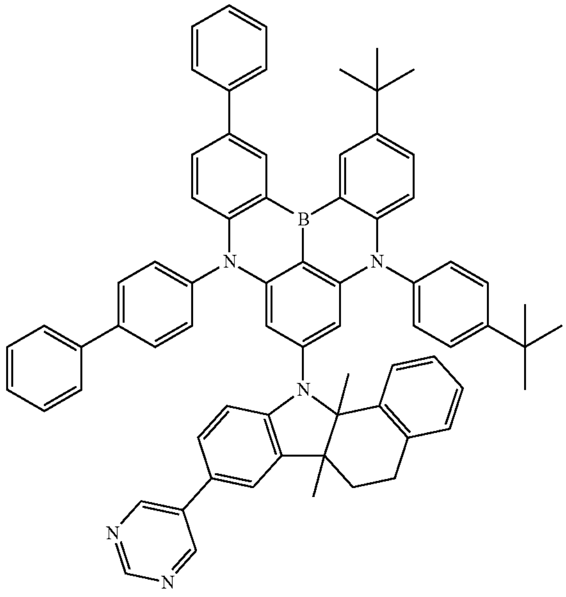

-continued
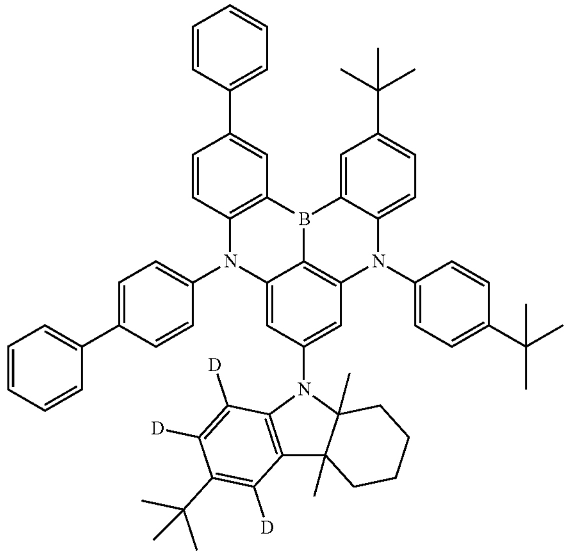
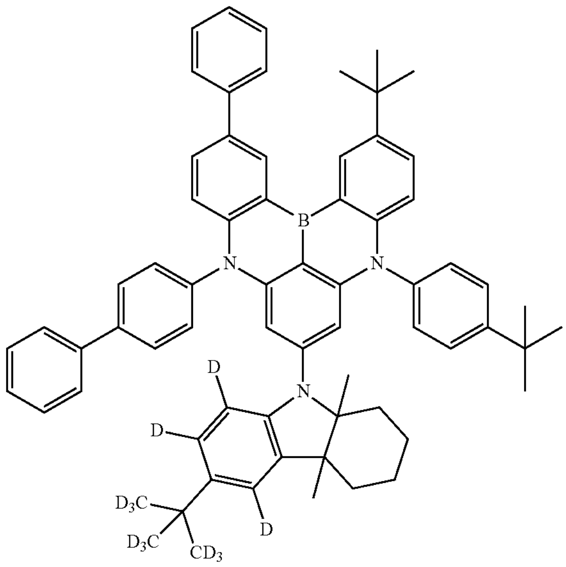
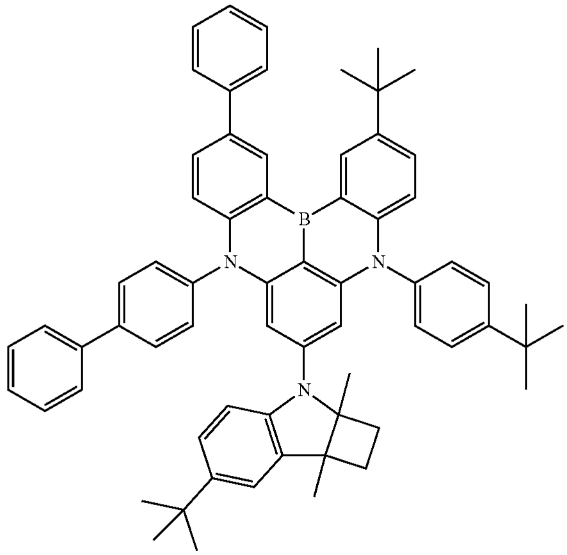
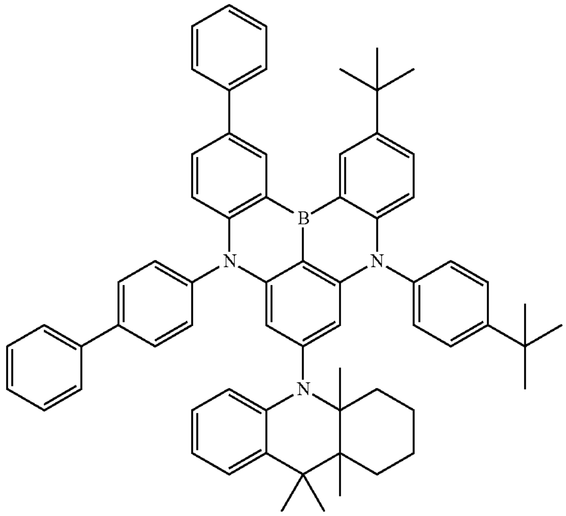
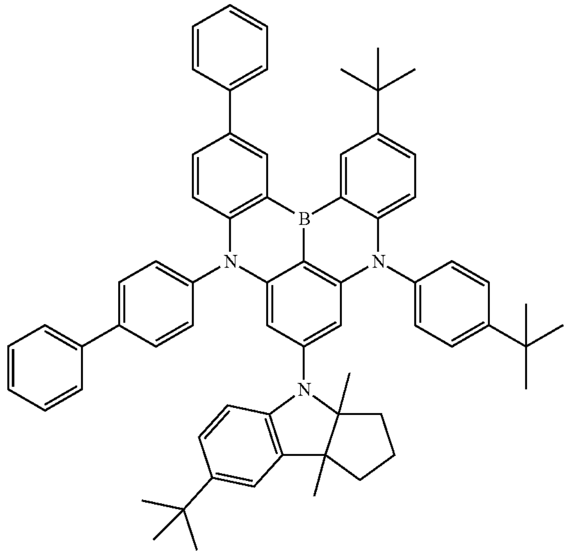
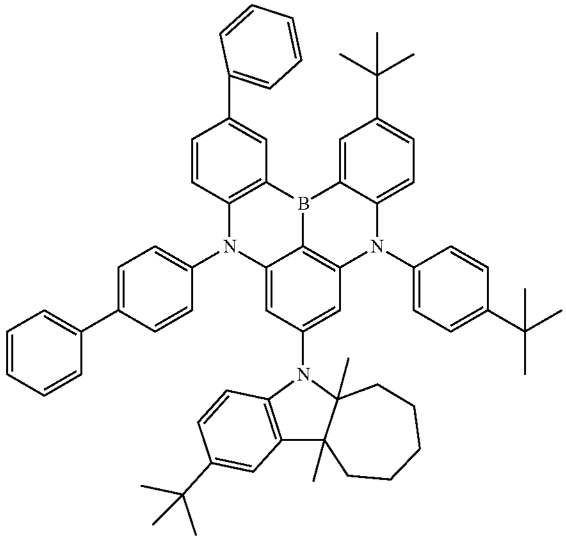
-continued -continued
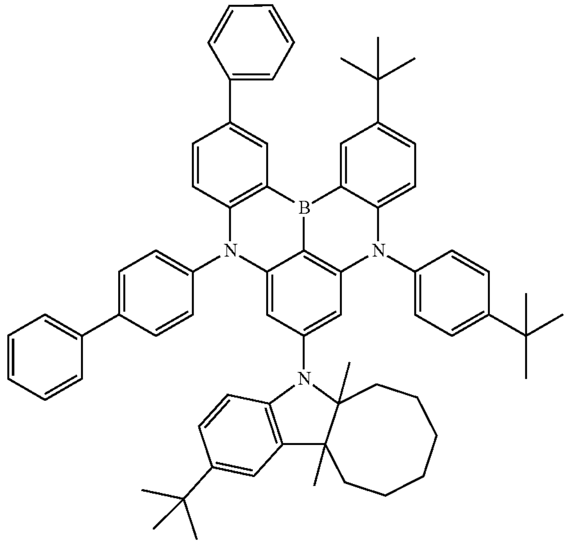
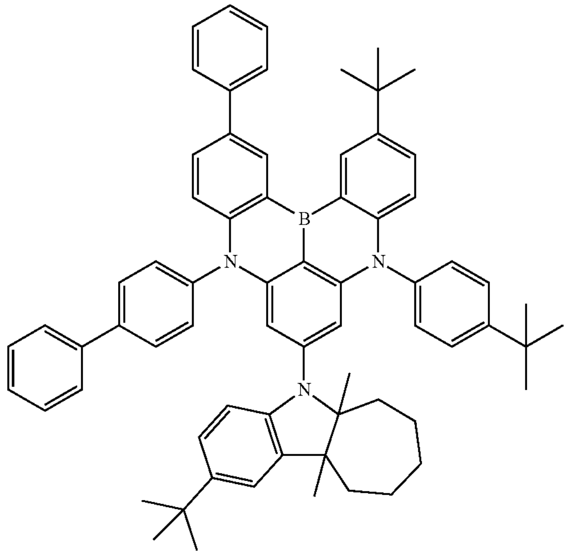
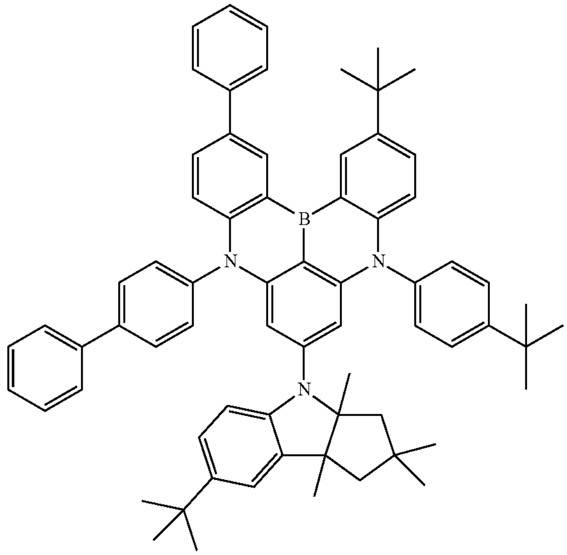
-continued
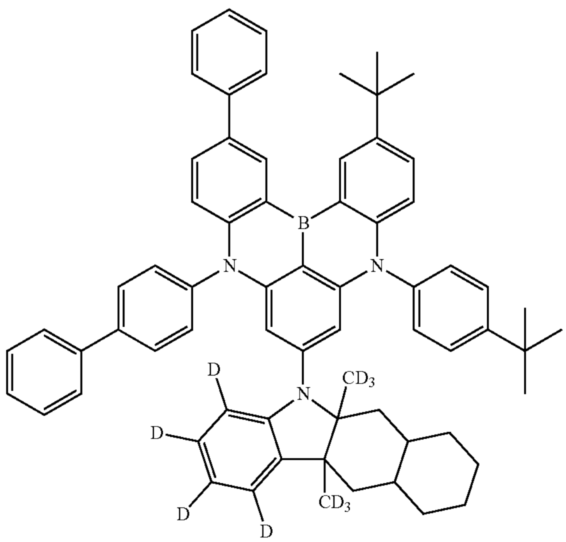
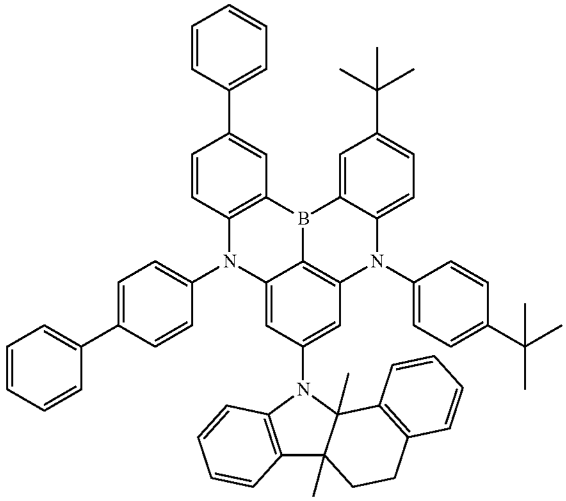
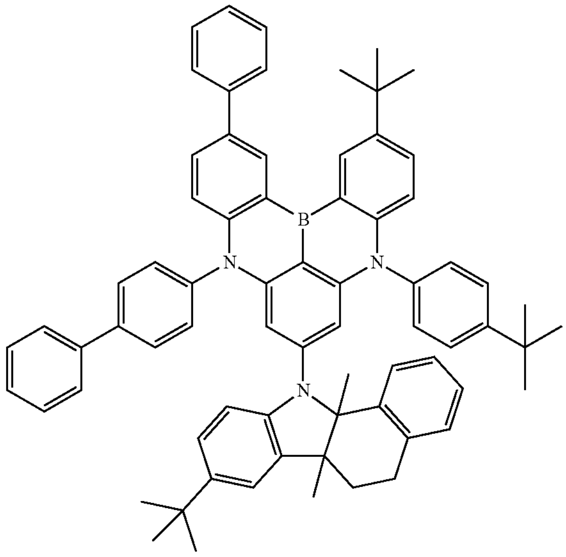

-continued
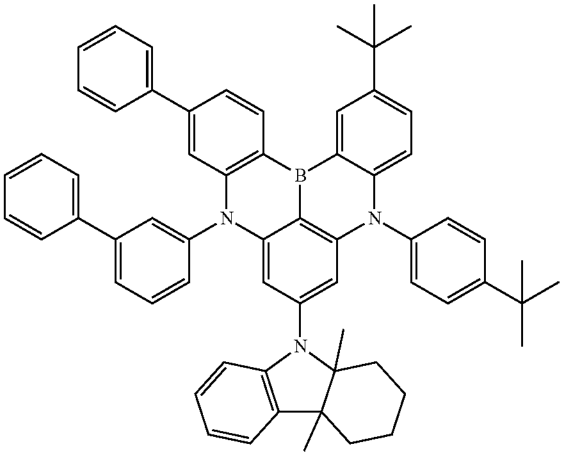
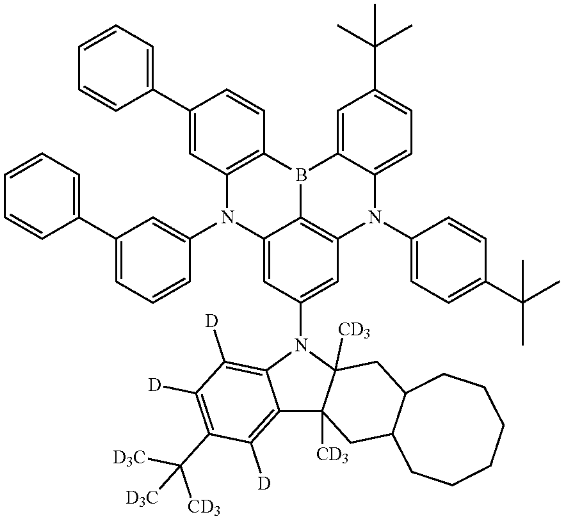
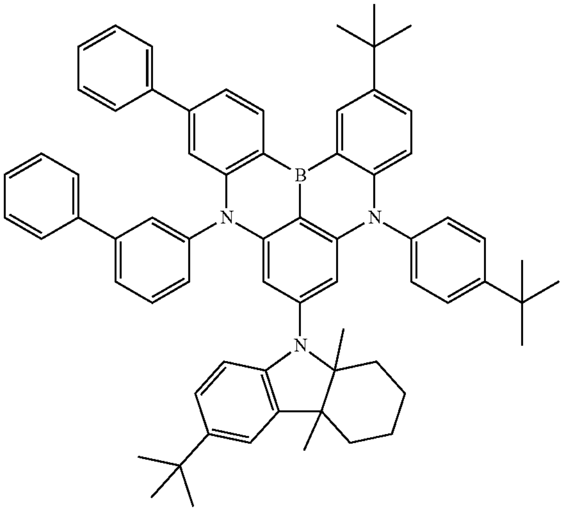
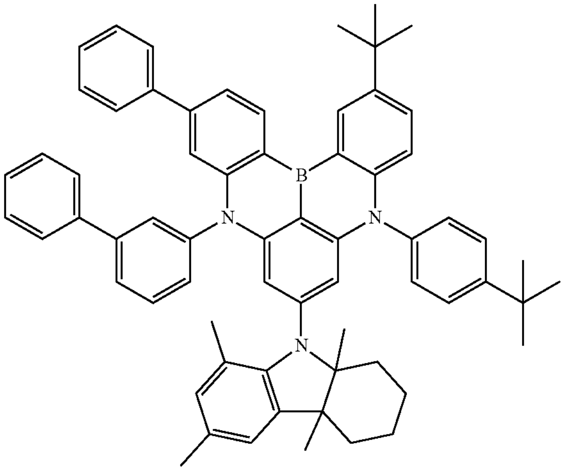
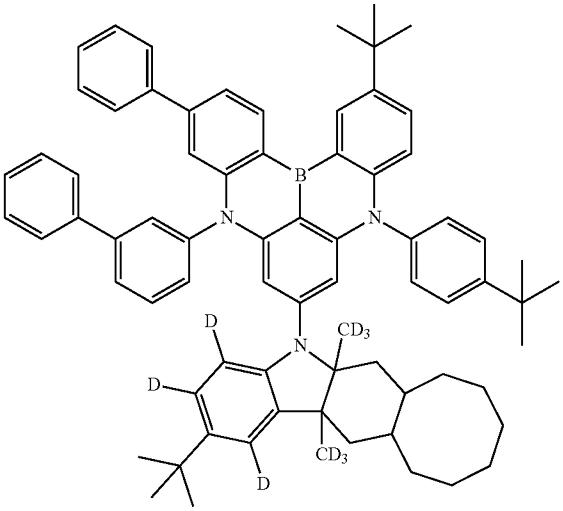
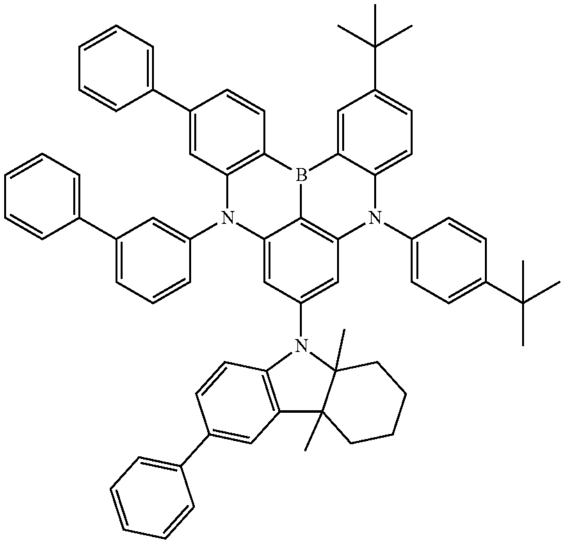

-continued
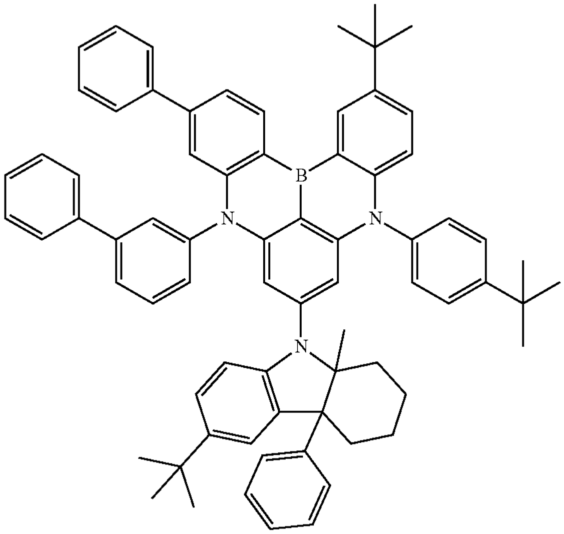
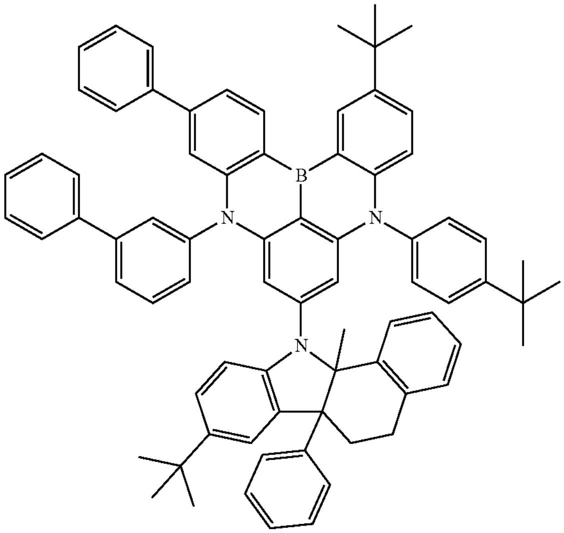
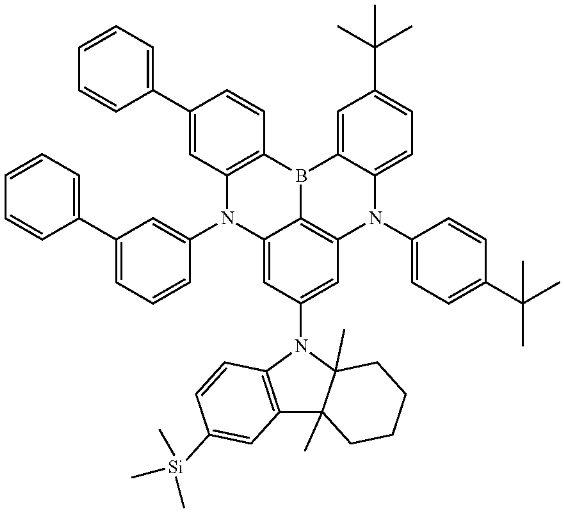
-continued
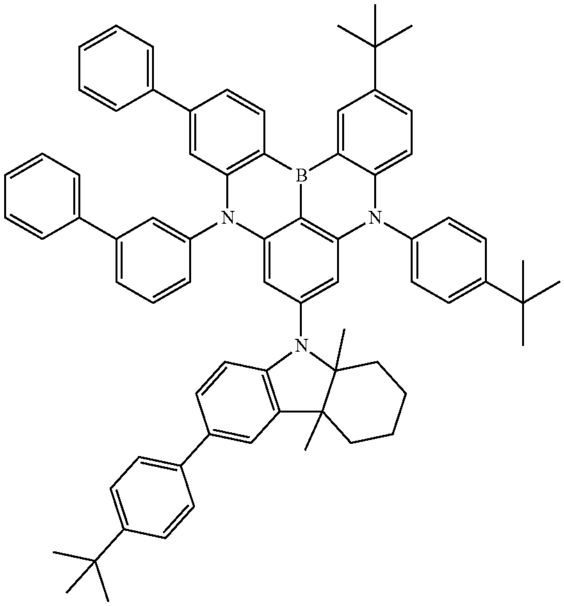
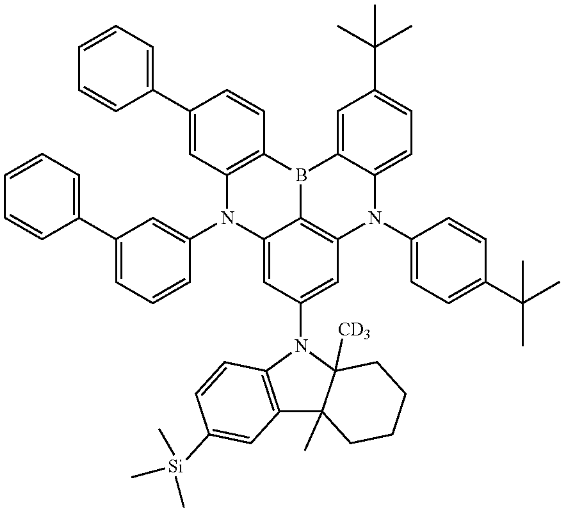
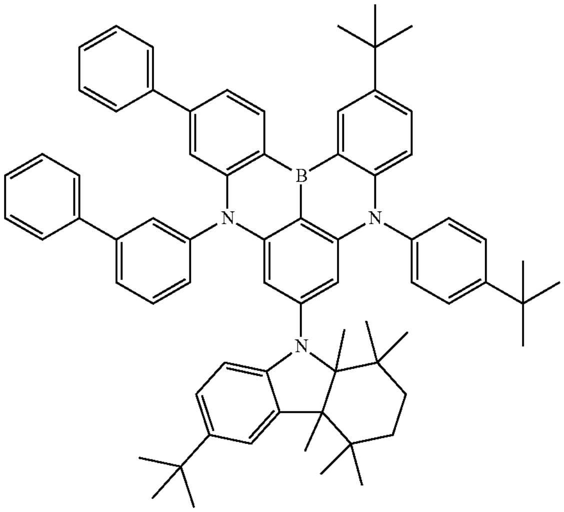

-continued
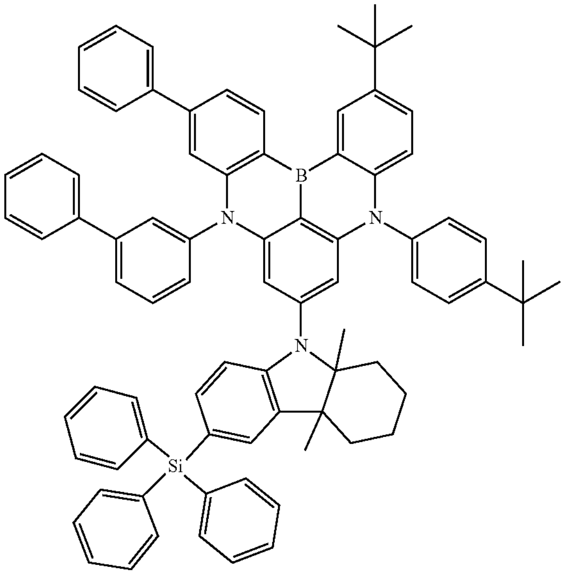
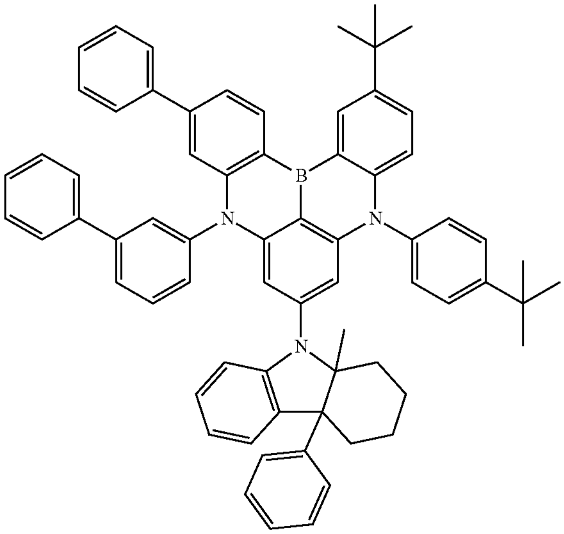
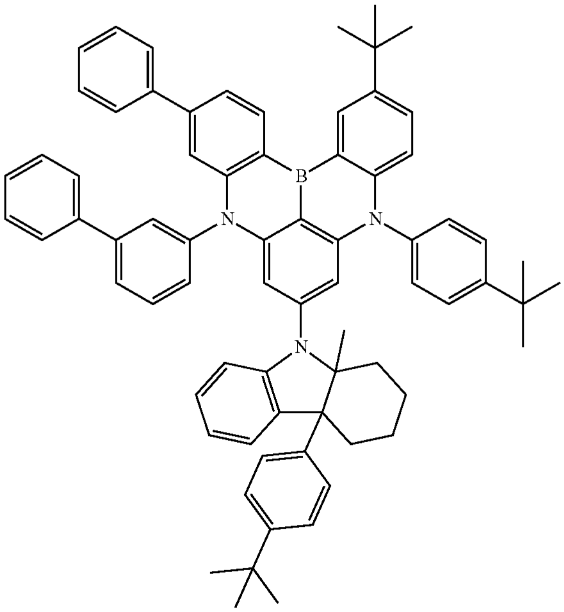
-continued
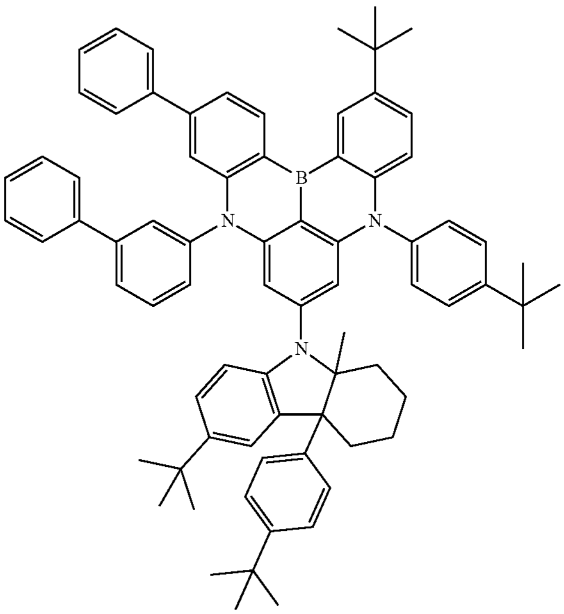
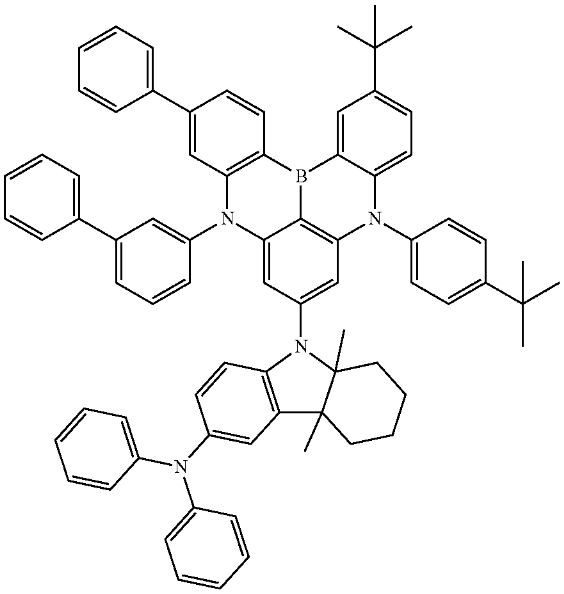

-continued
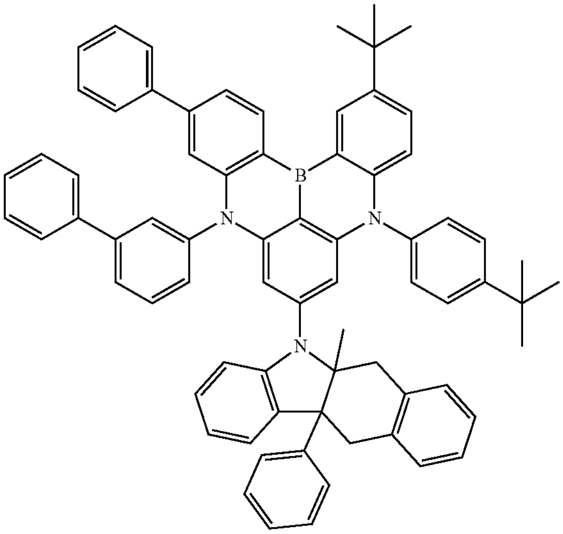
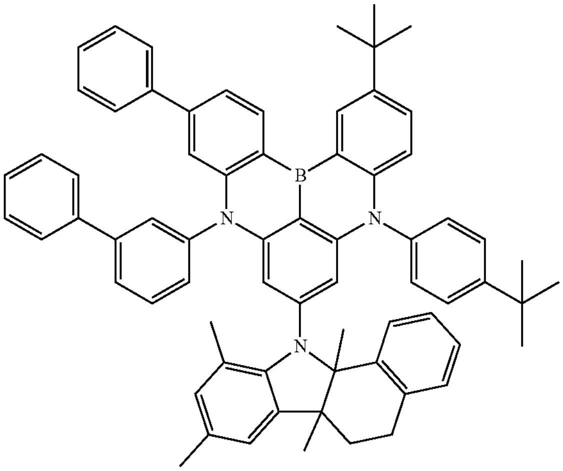
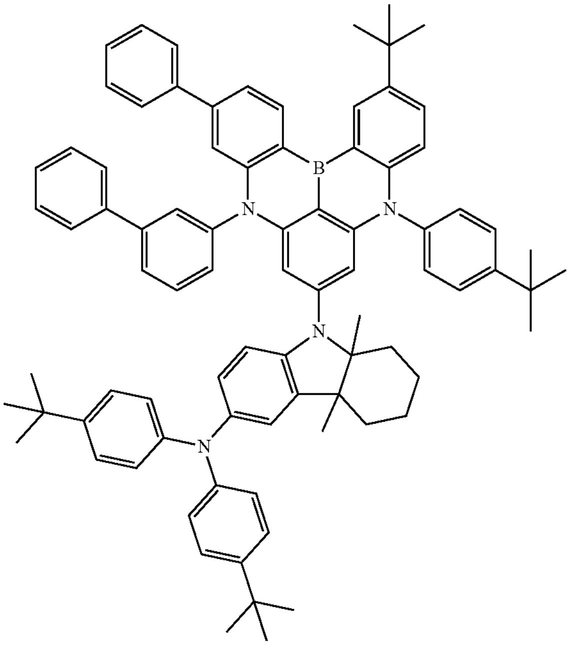
-continued
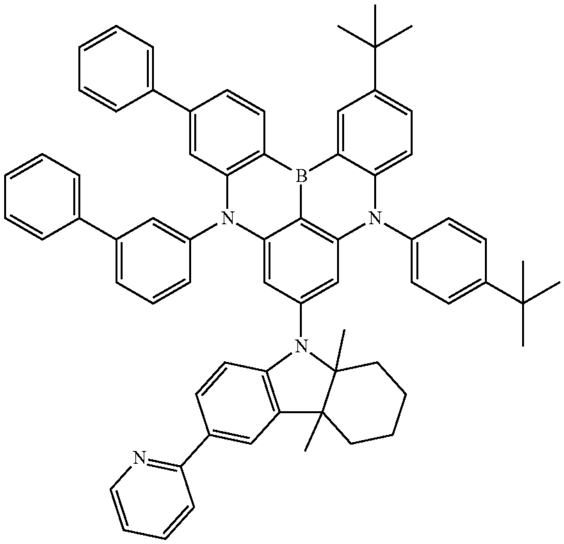
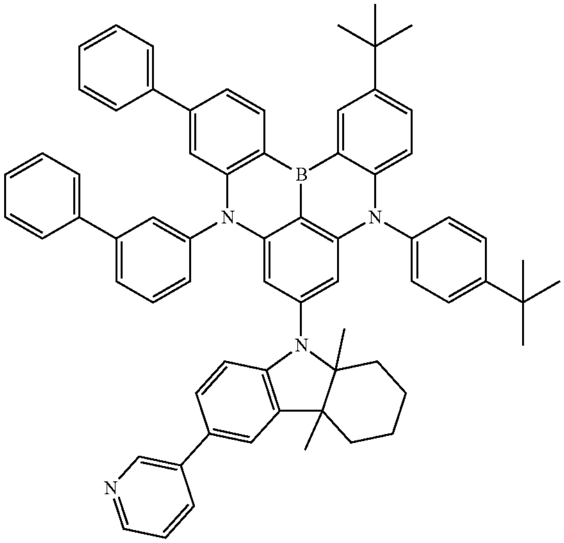
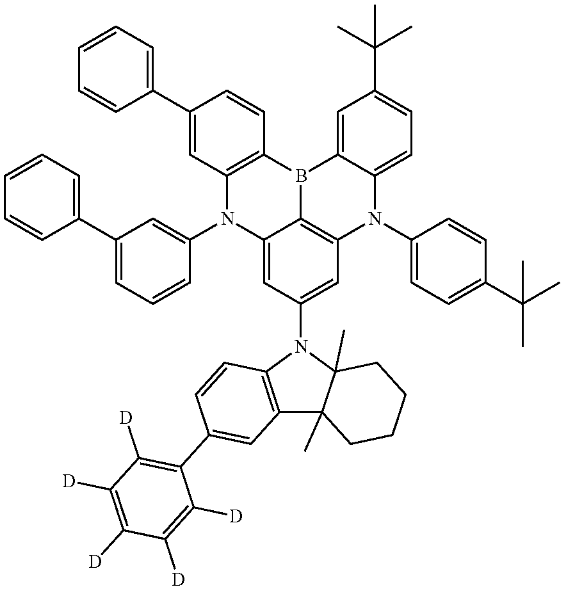

-continued
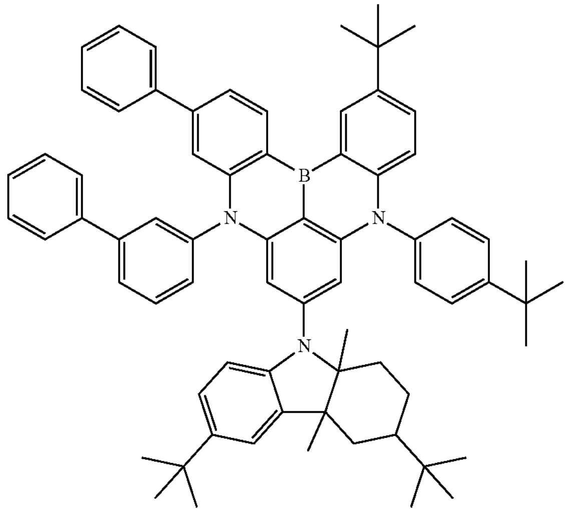
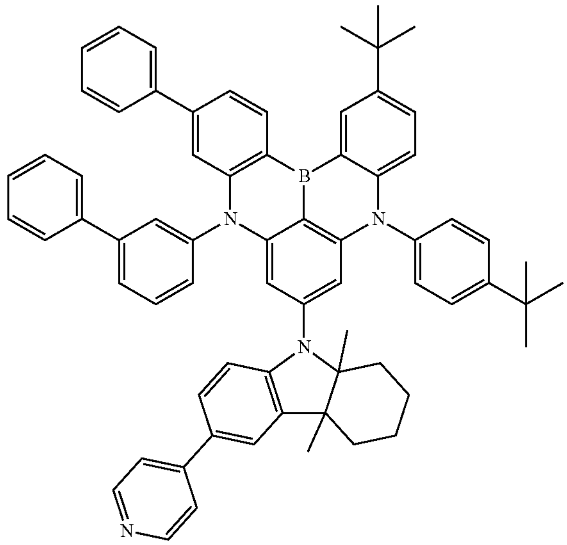
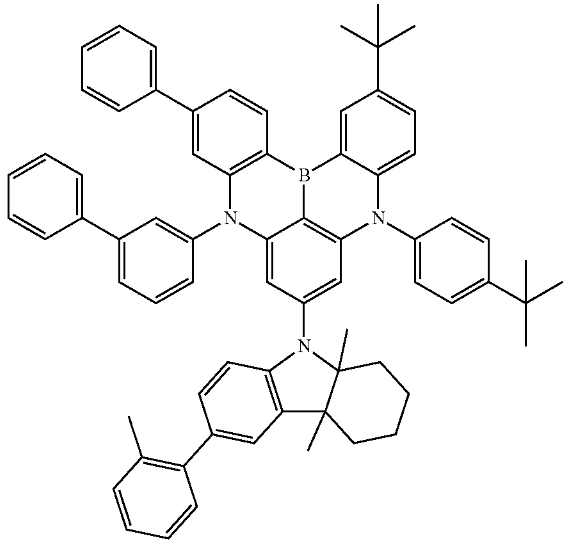
-continued
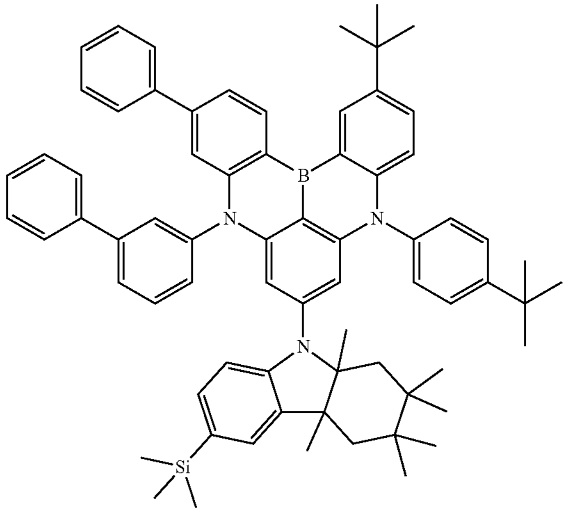
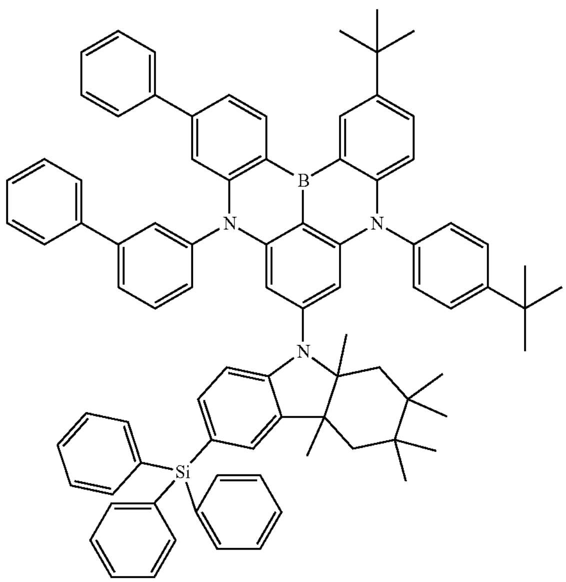
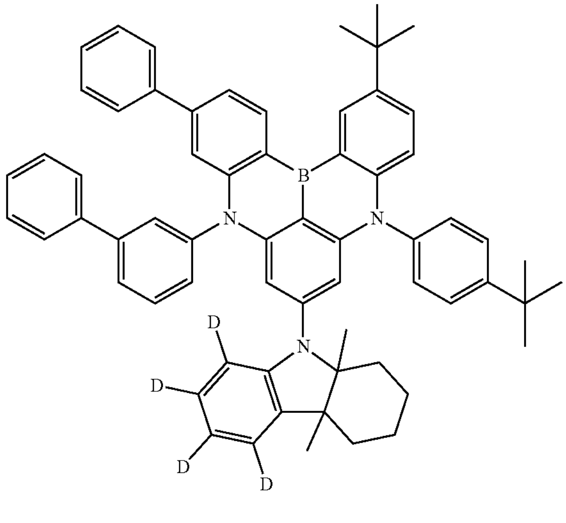

-continued
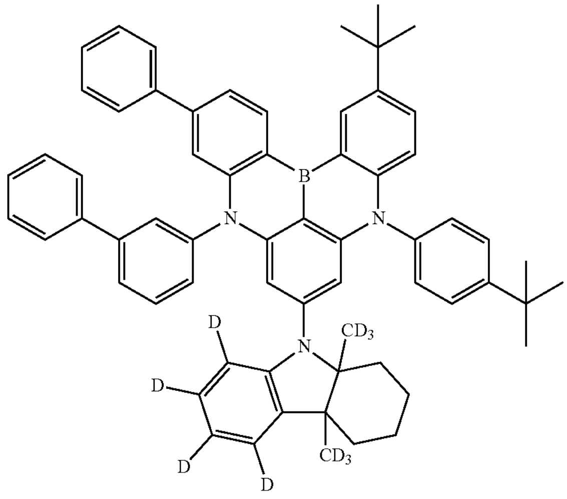
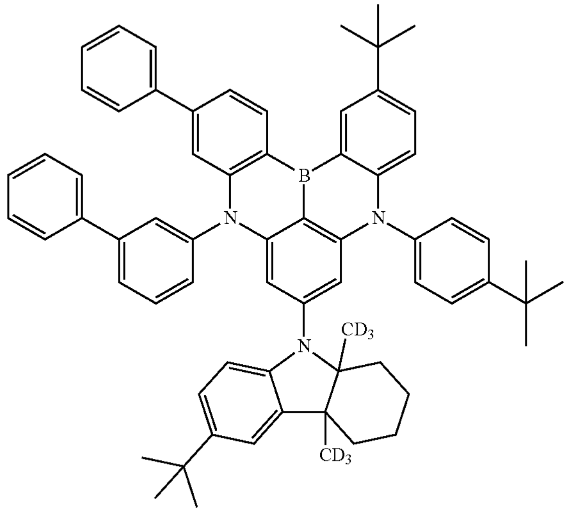
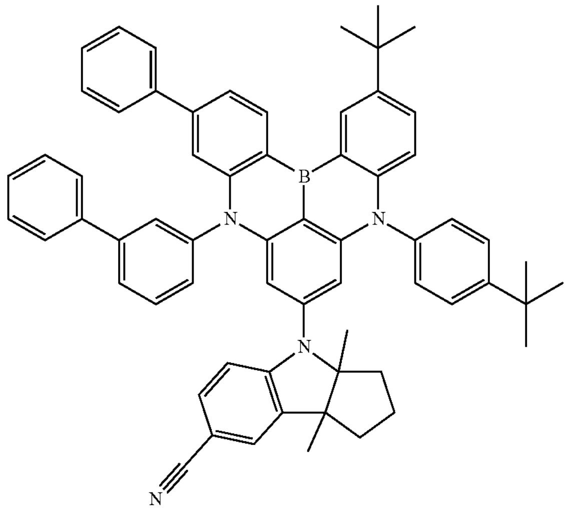
-continued
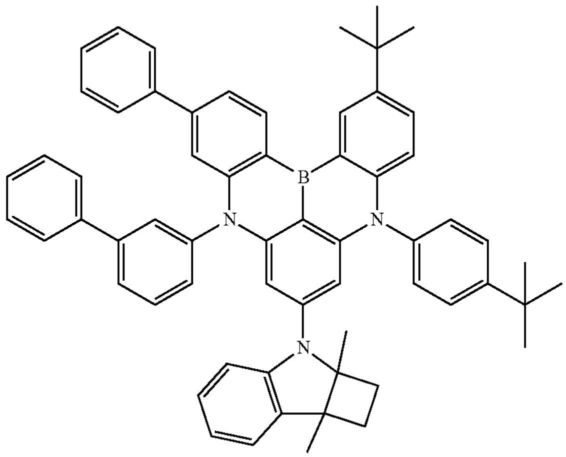
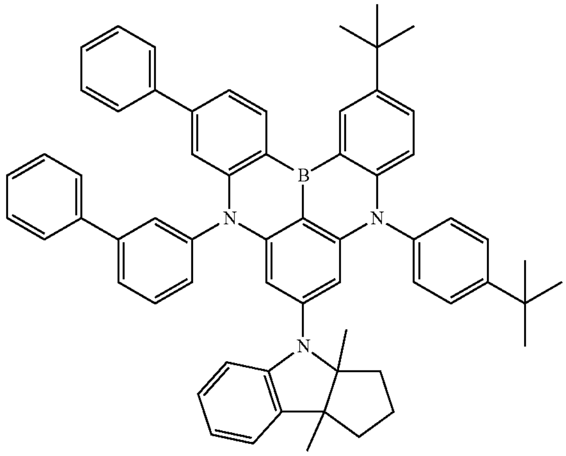
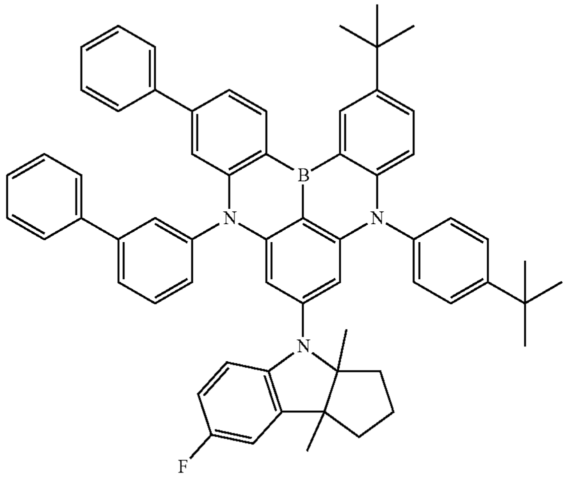

-continued
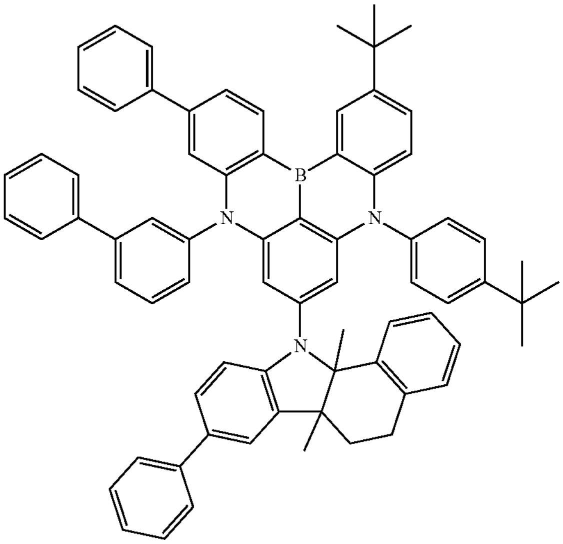
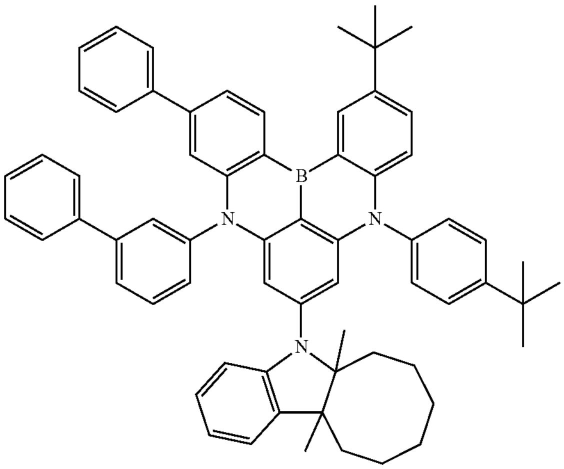
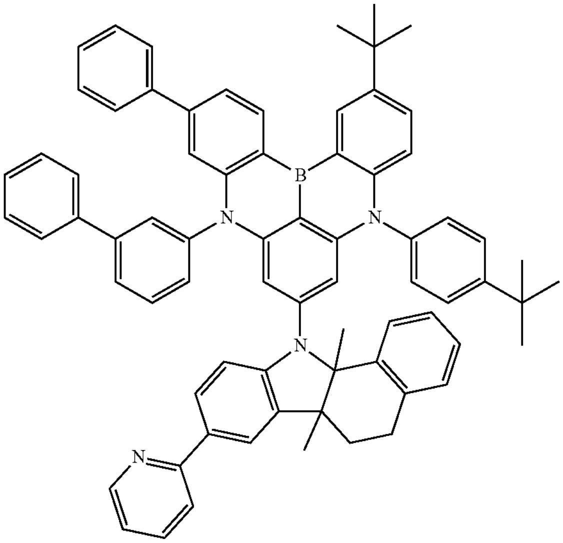
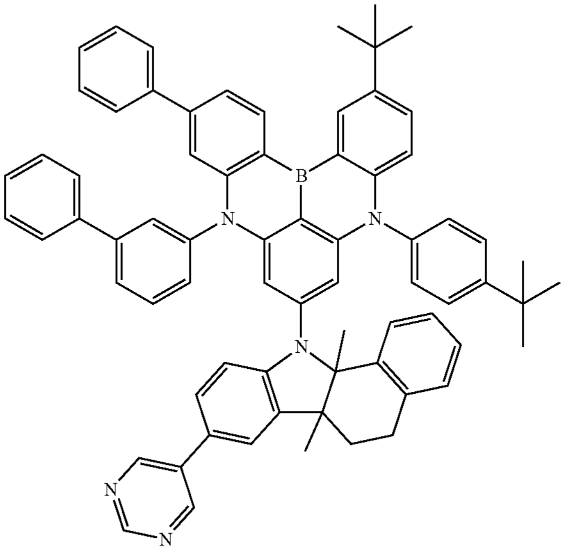
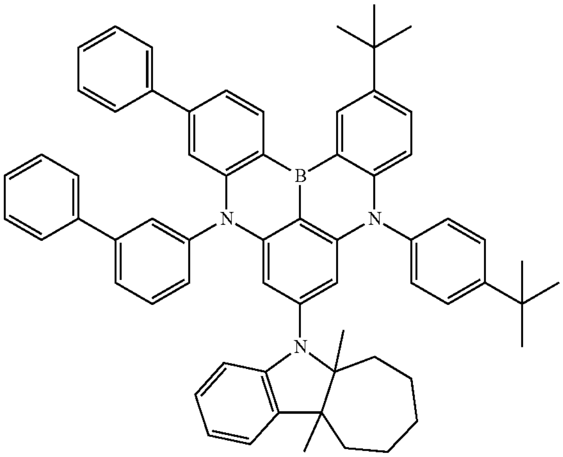
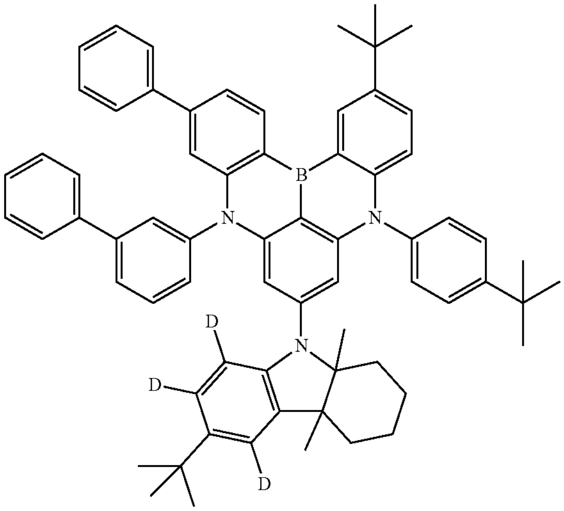

-continued
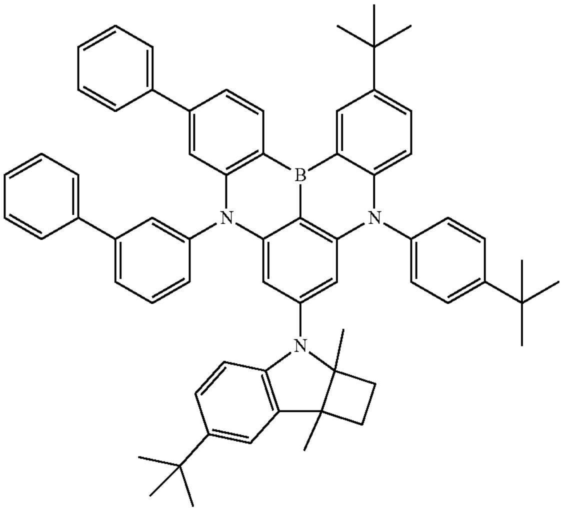
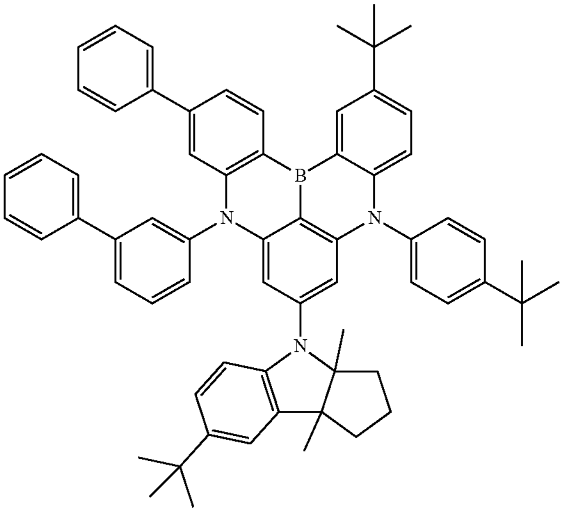
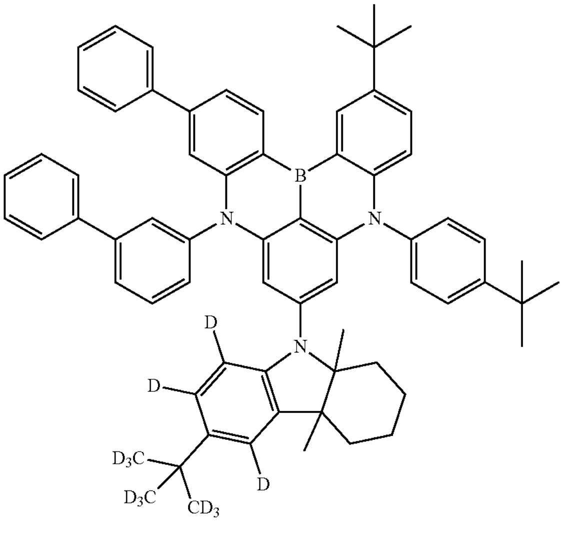
-continued
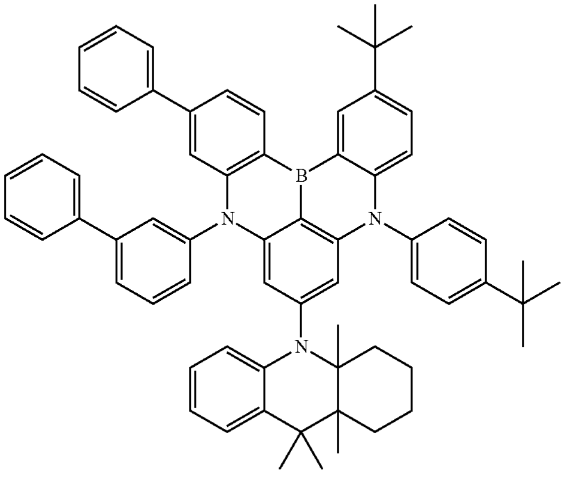
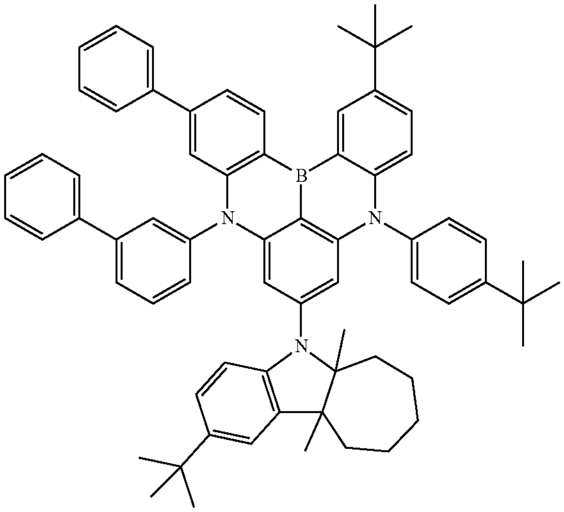
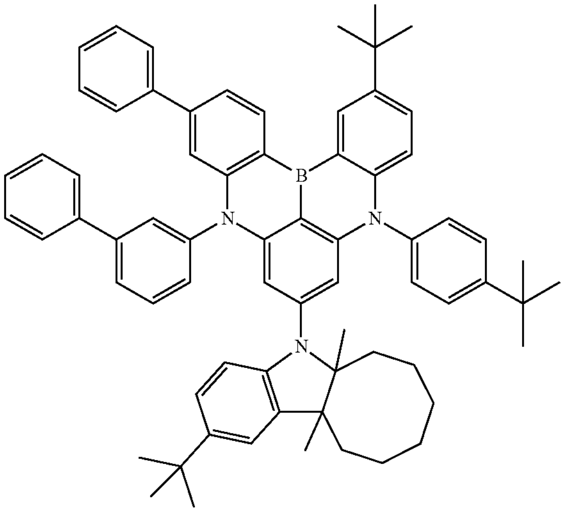

-continued
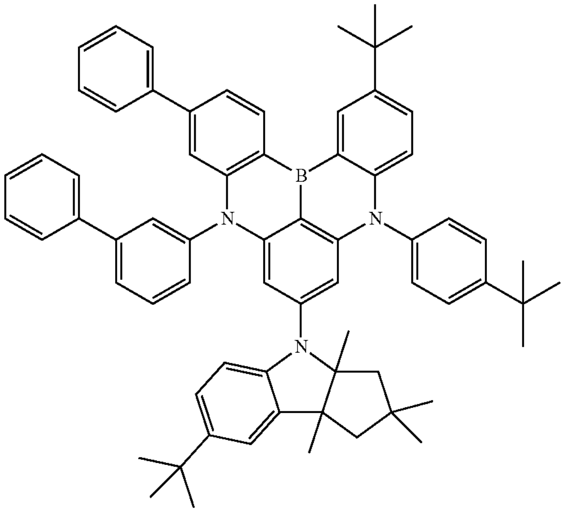
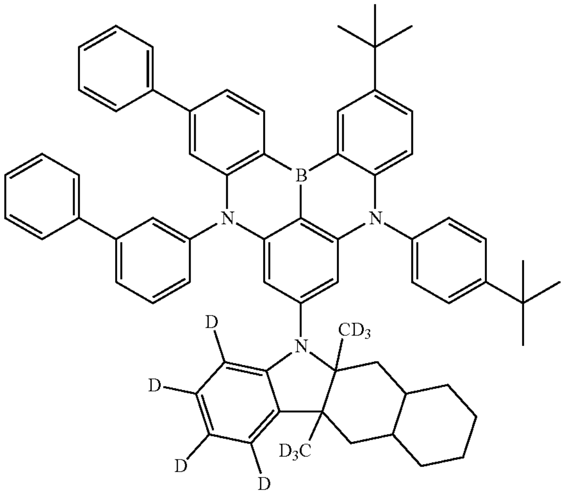
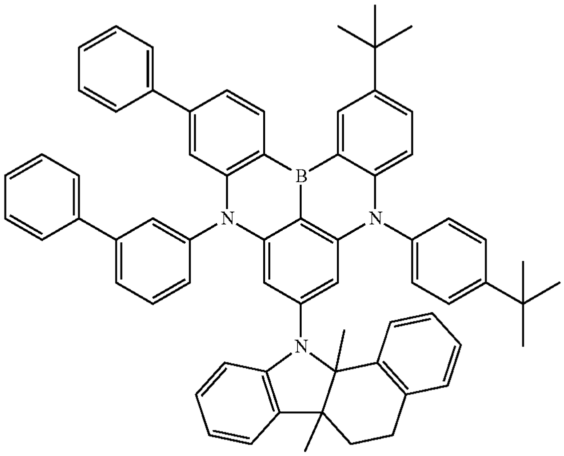
-continued
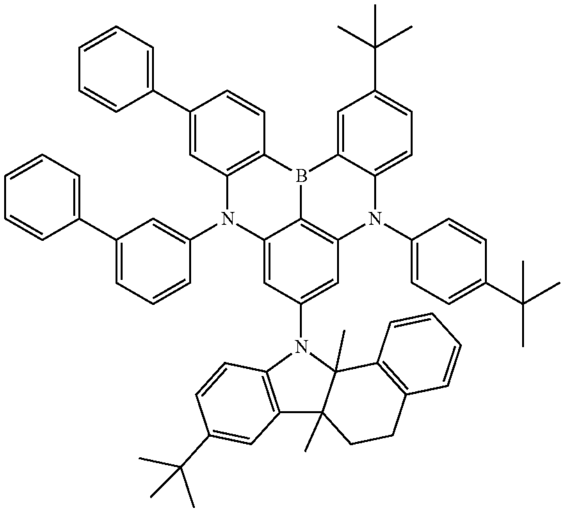
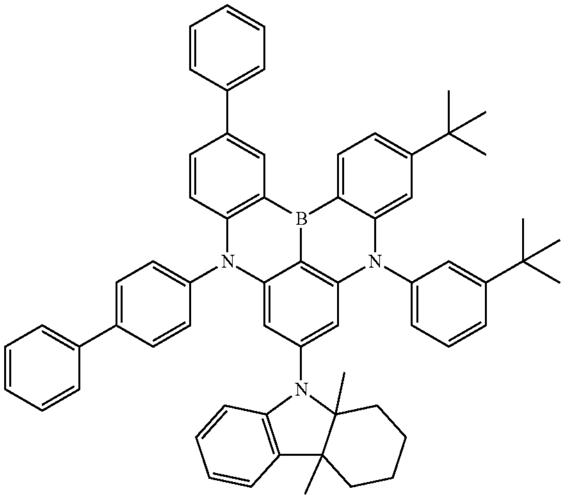
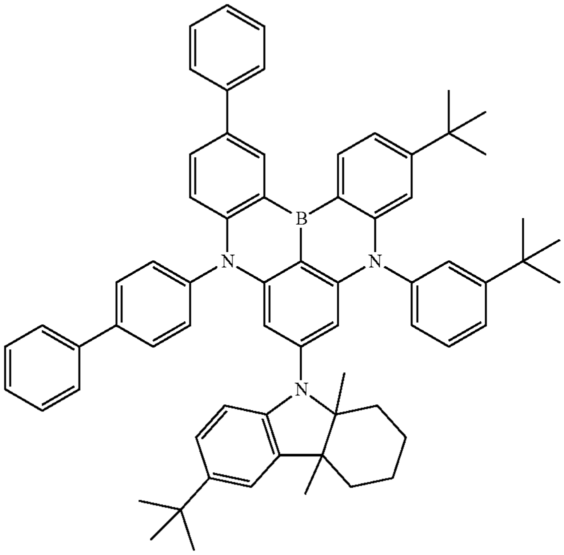

-continued
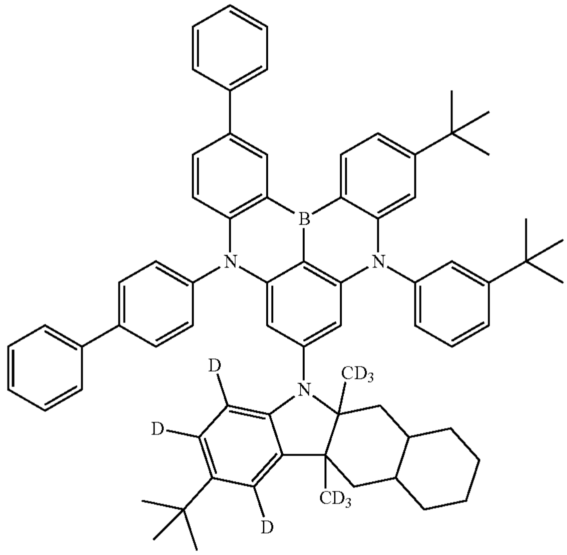
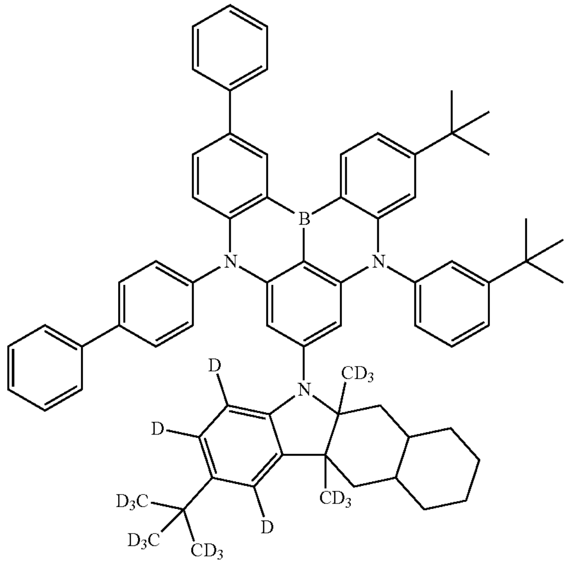
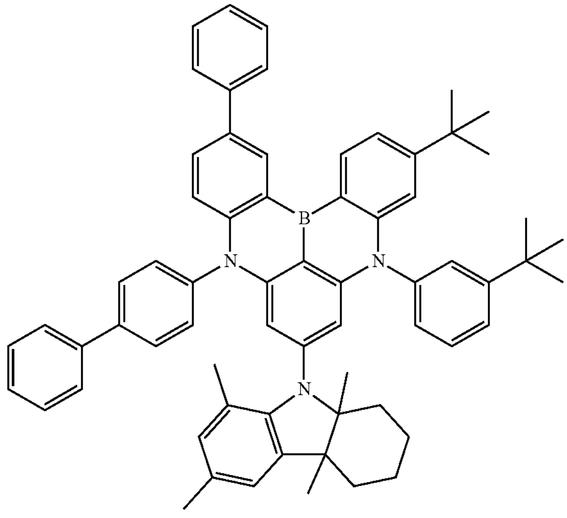
-continued
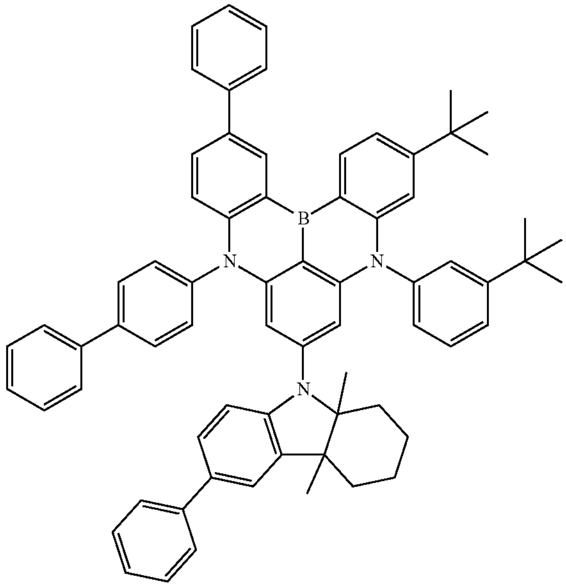
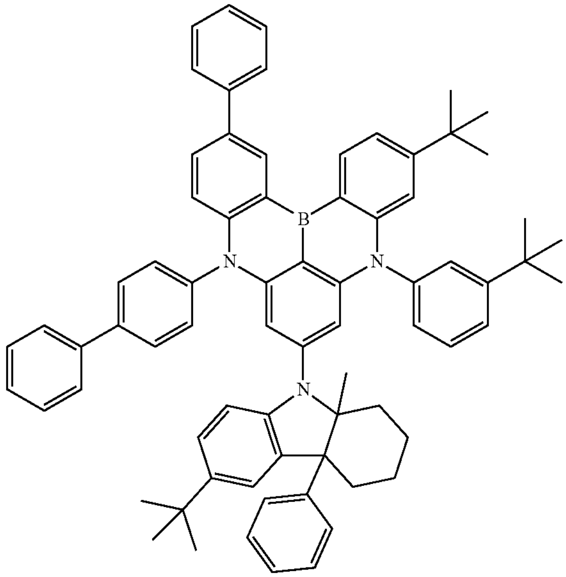

-continued
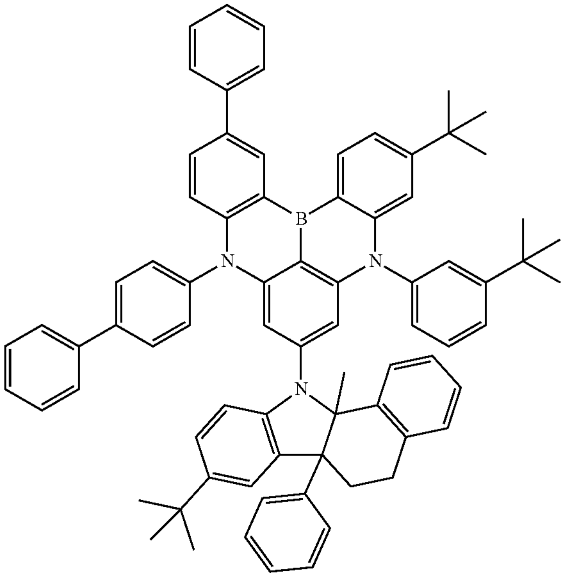
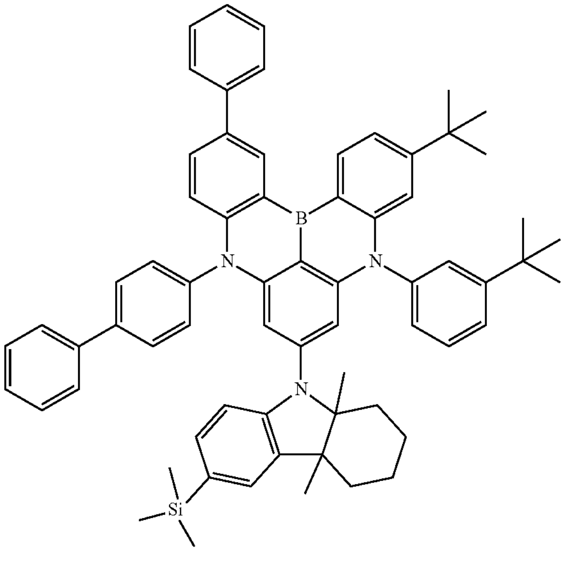
-continued
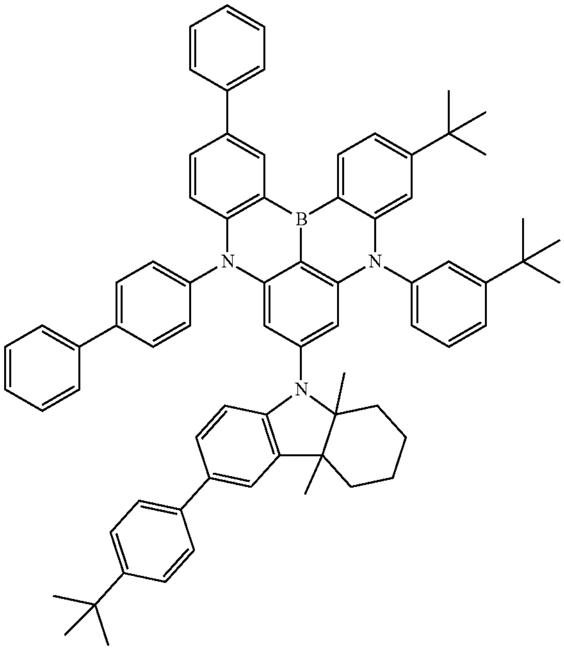
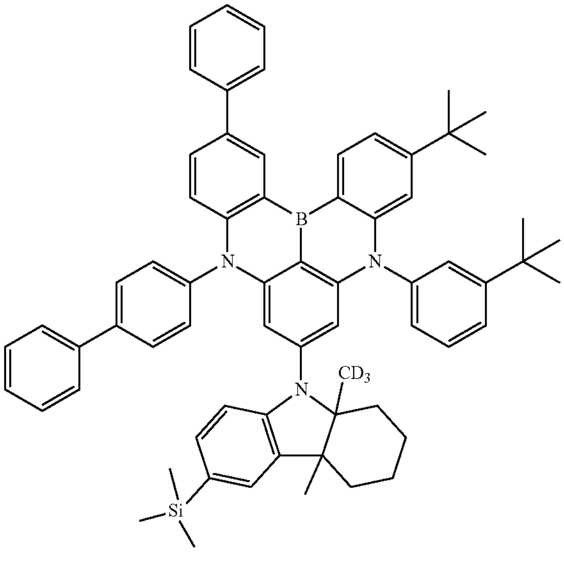

-continued
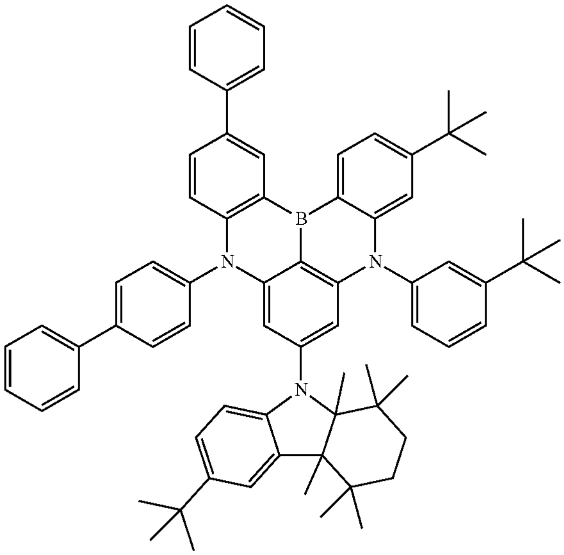
-continued
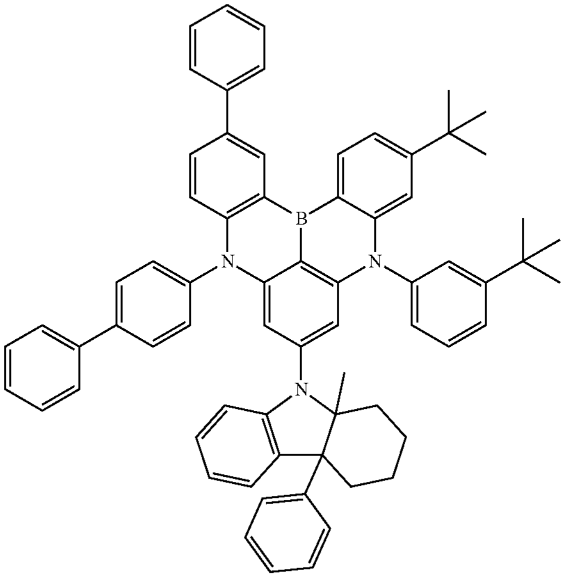
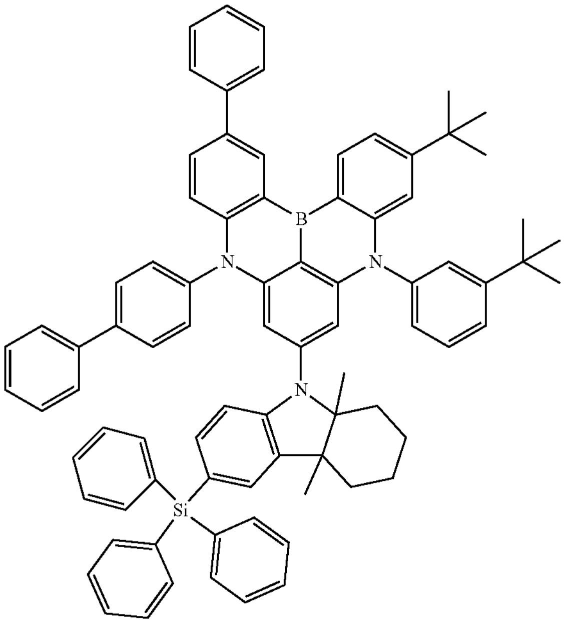
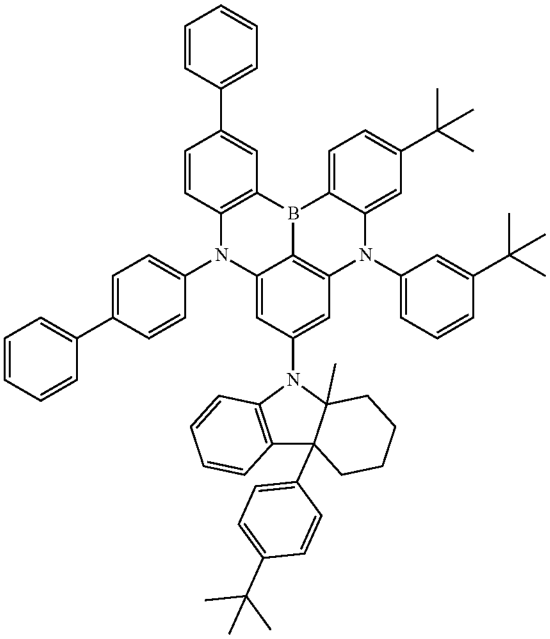

-continued
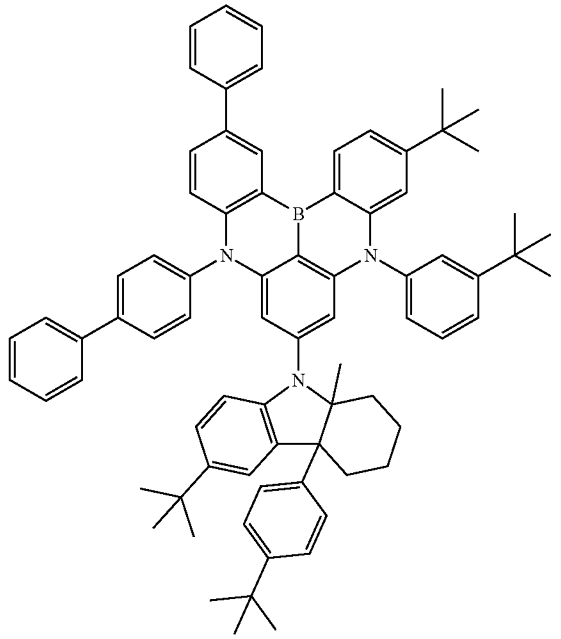
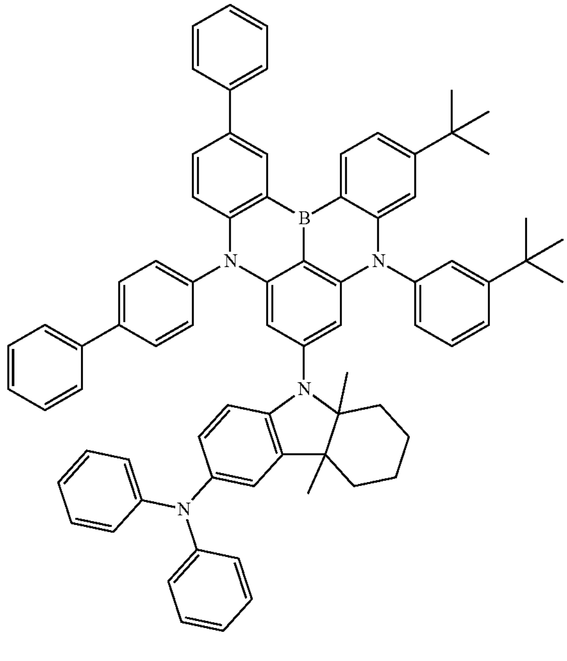
-continued
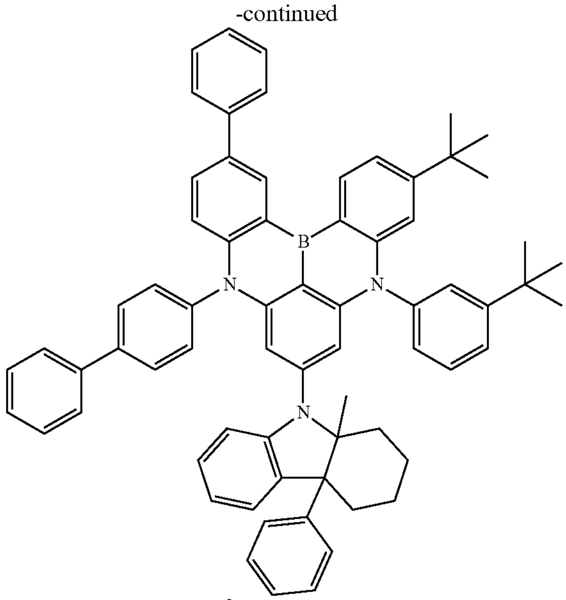
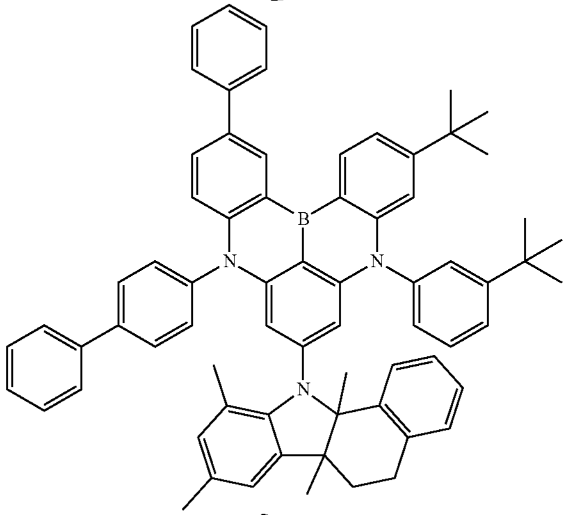
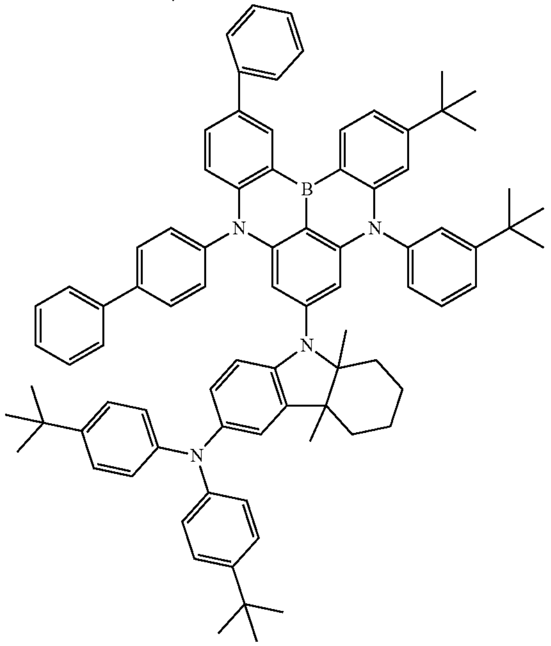

-continued
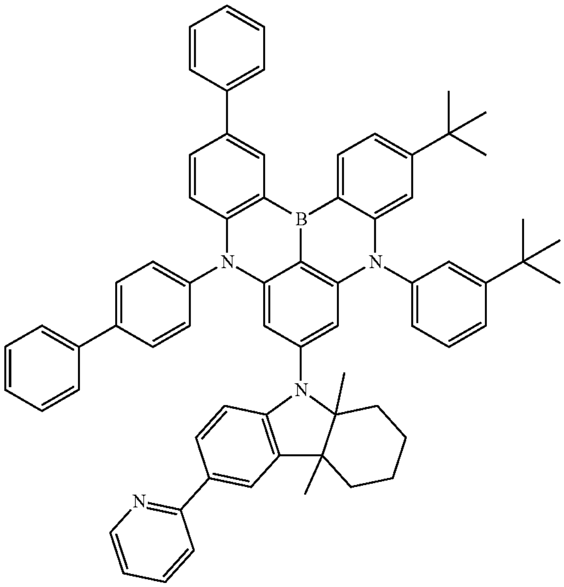
-continued
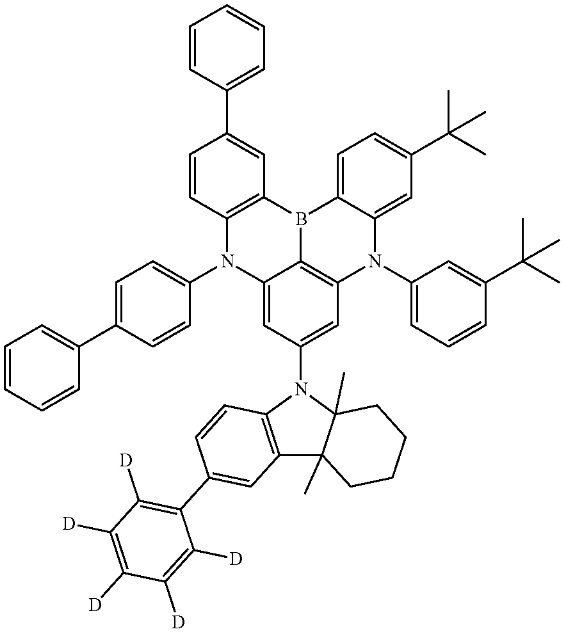
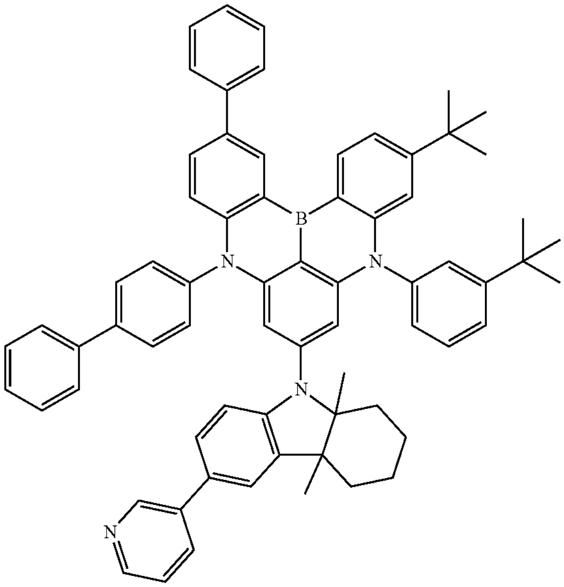
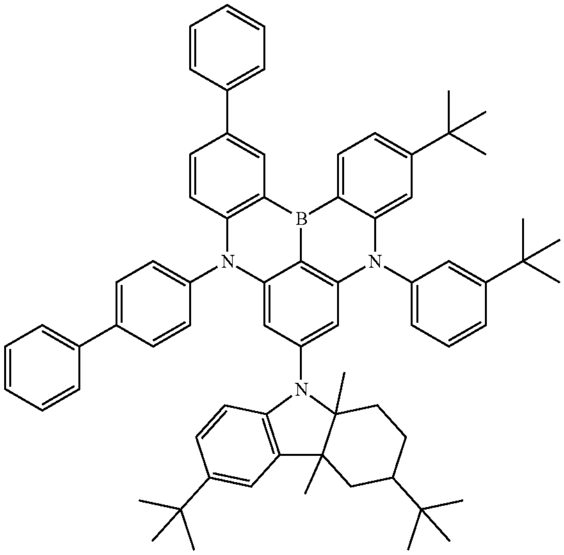

-continued
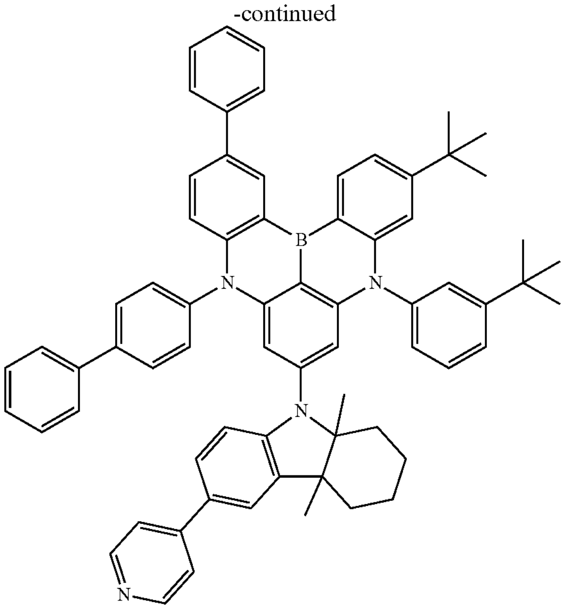
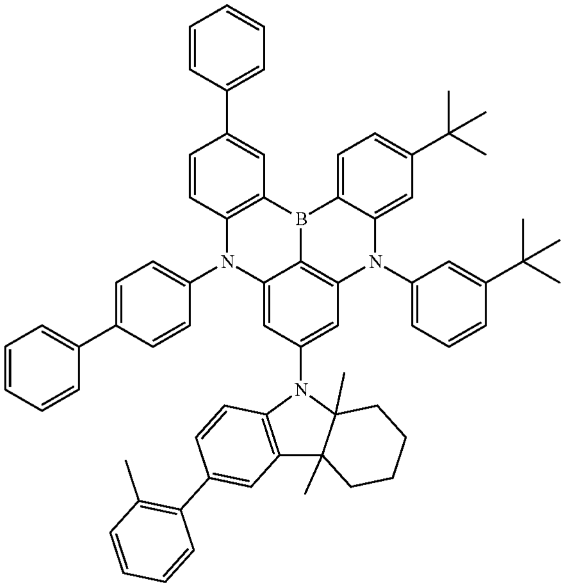
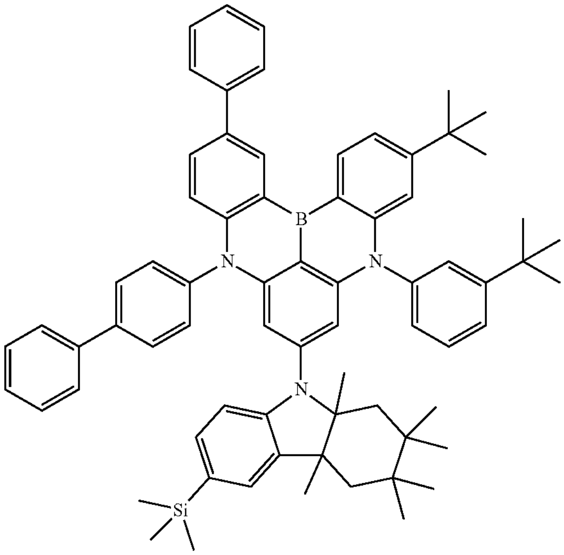
-continued
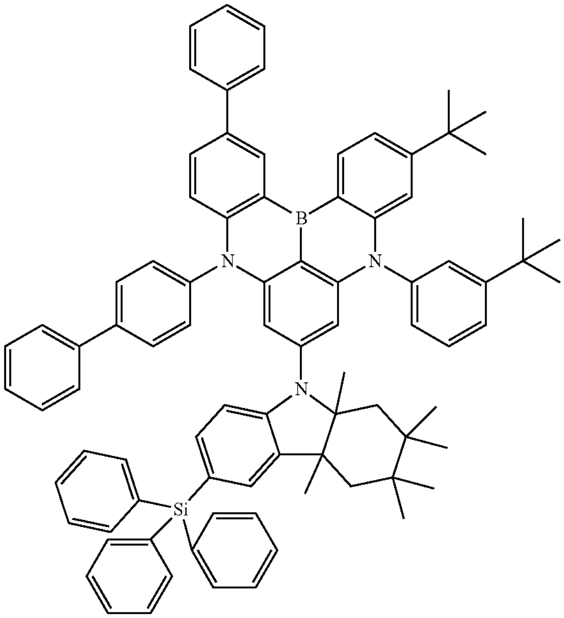
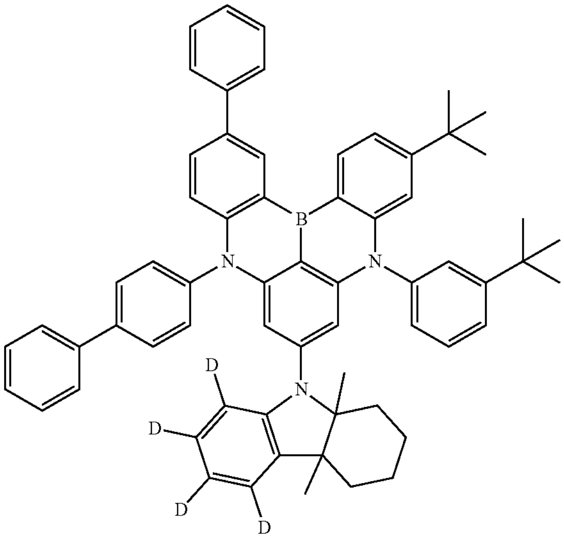
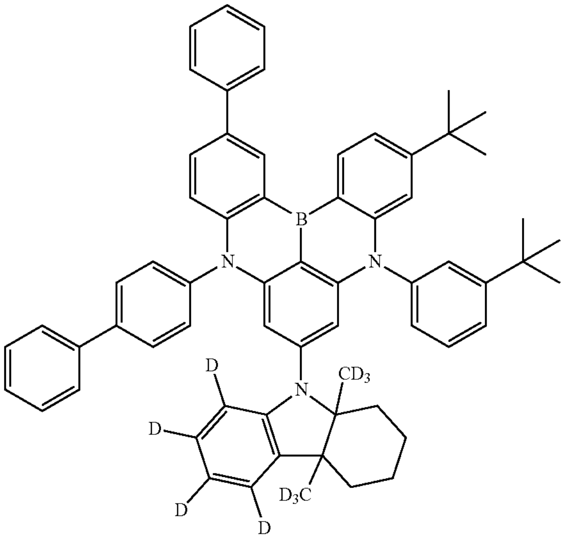

-continued
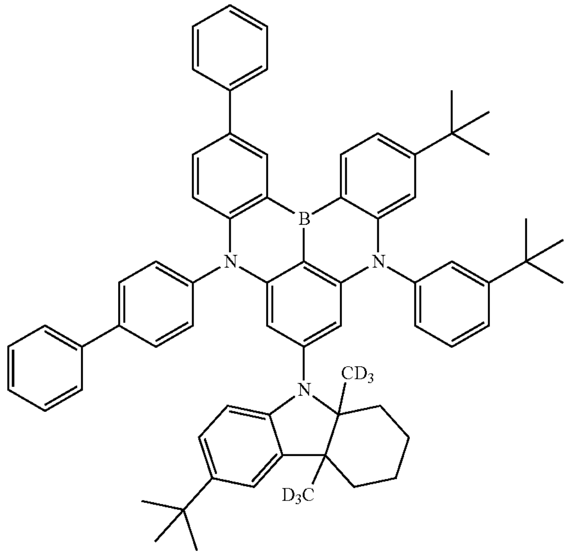
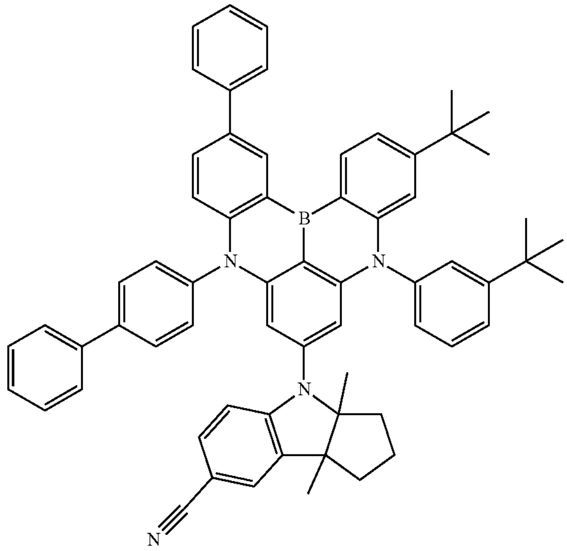
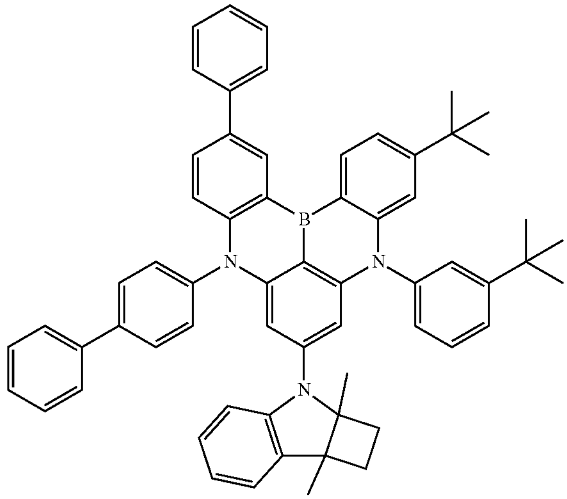
-continued
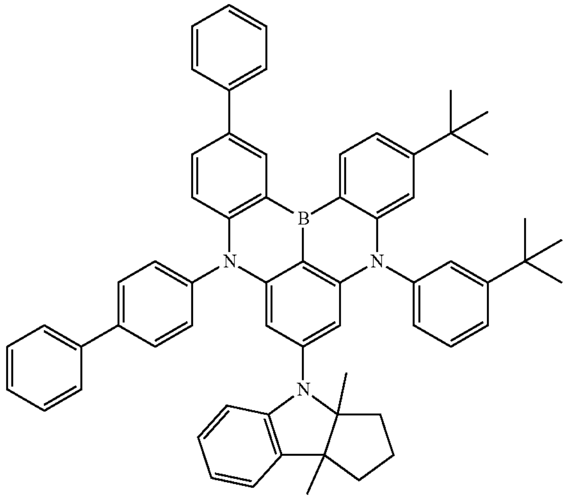
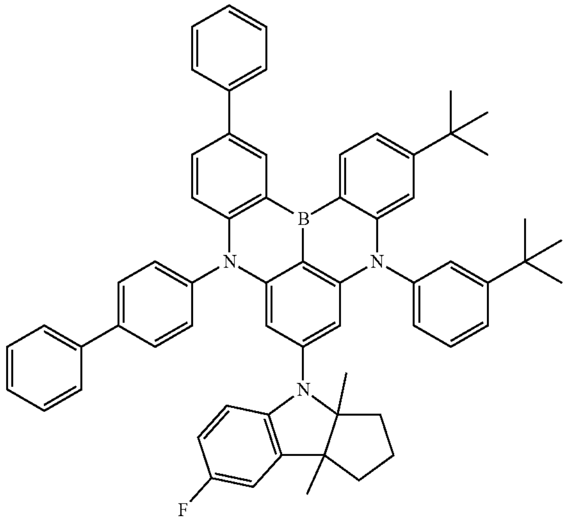
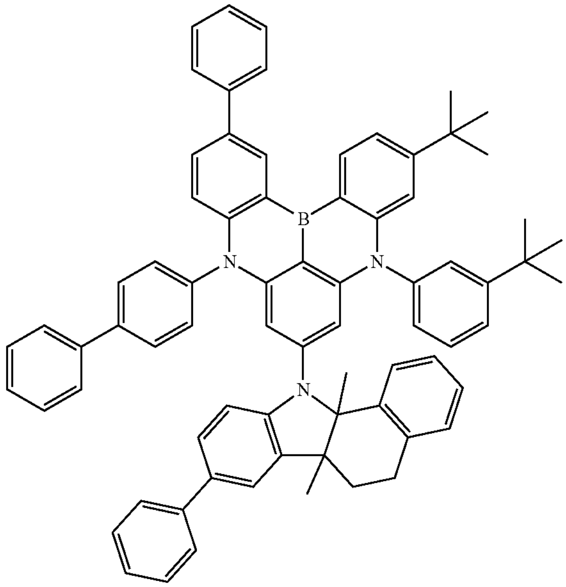

-continued
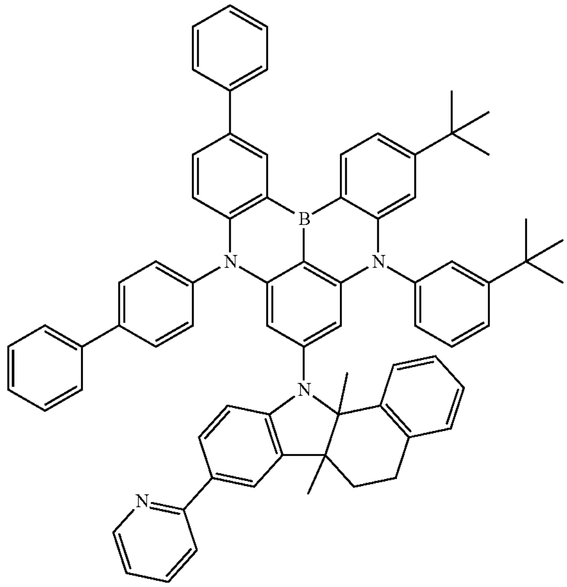
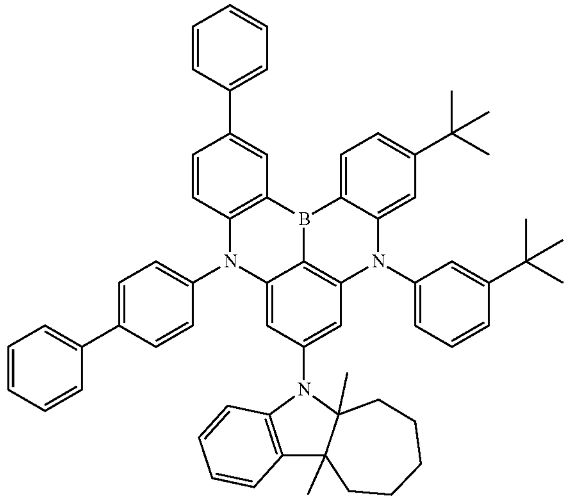
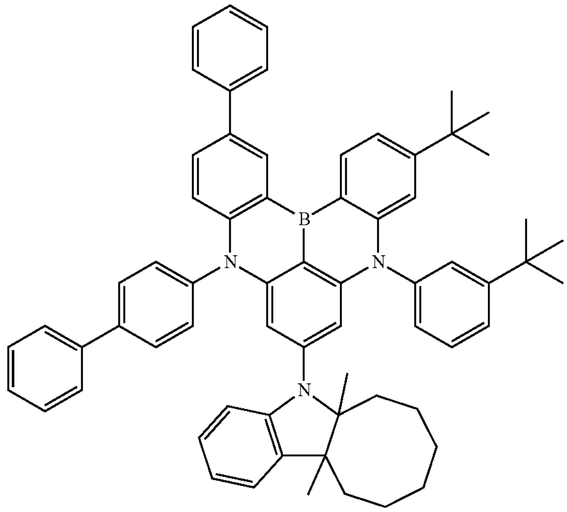
-continued
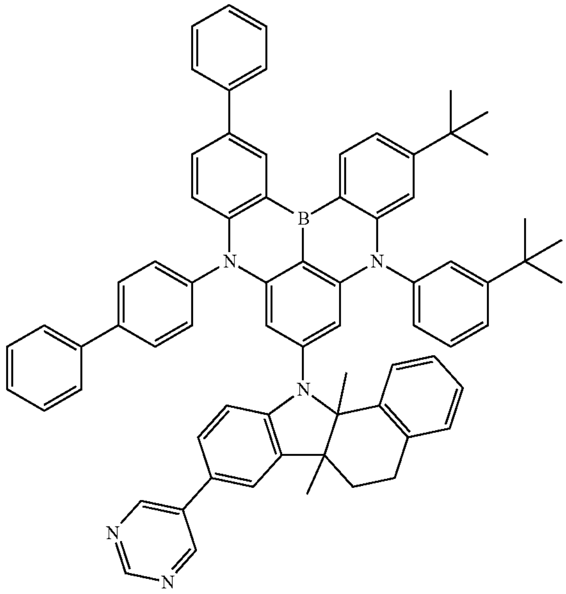
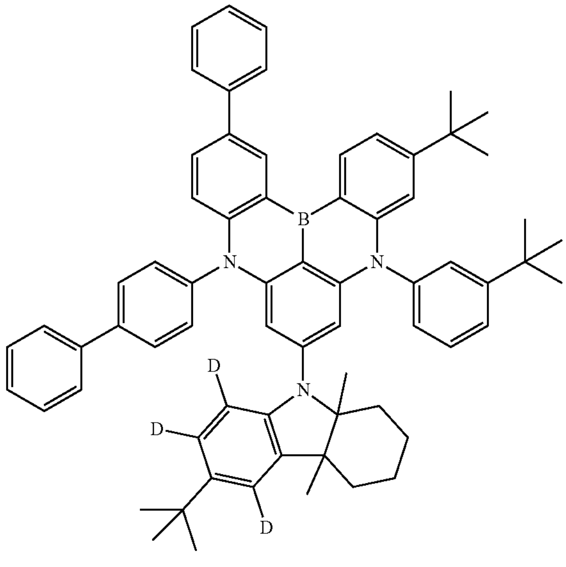
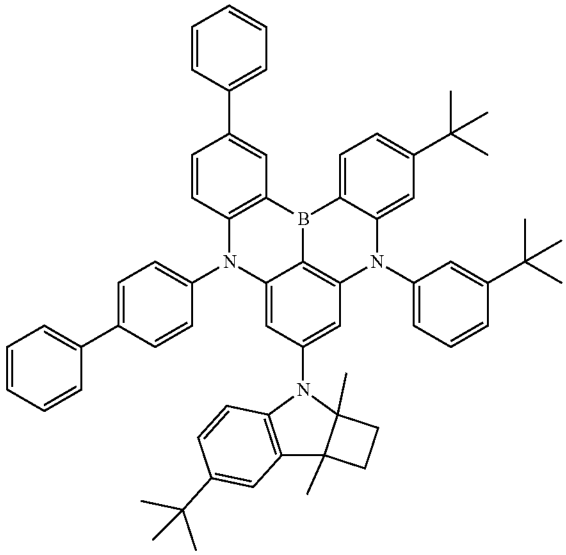

-continued
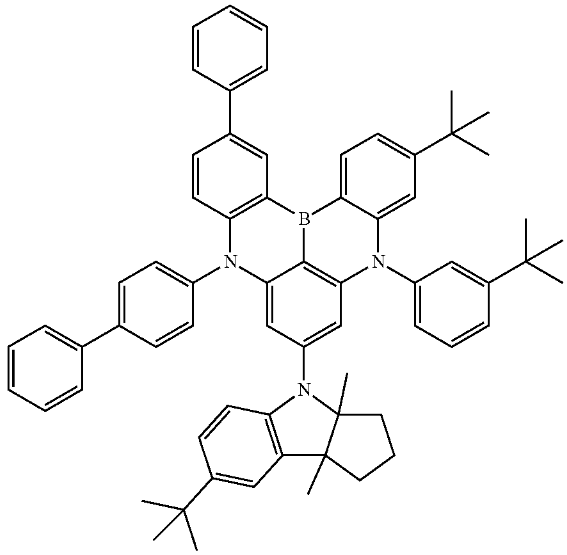
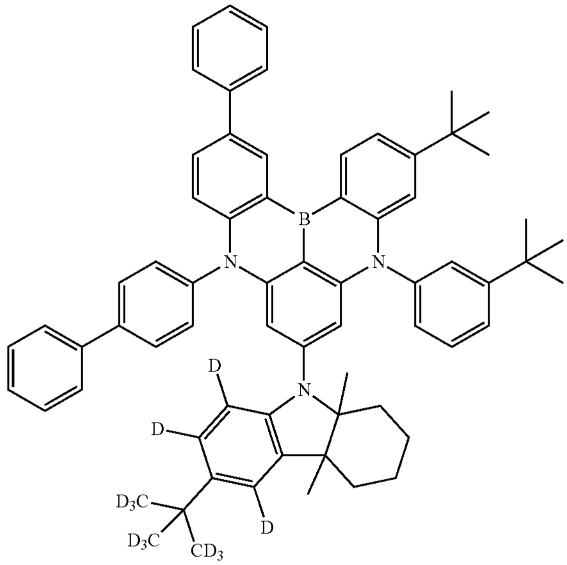
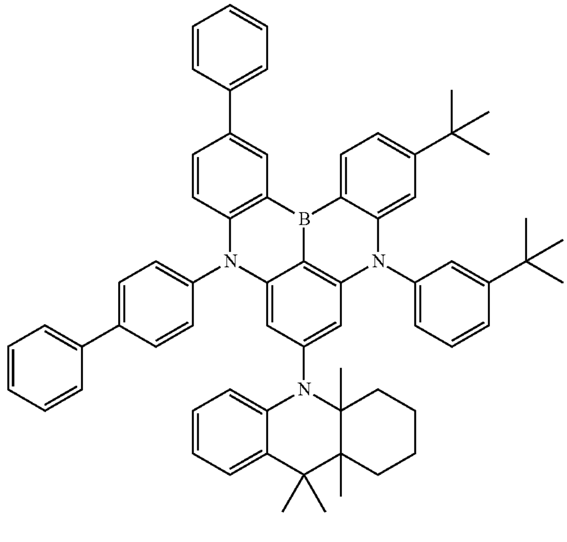
-continued
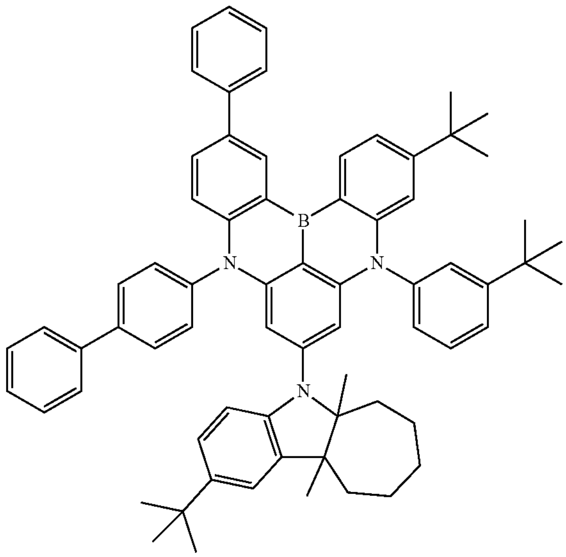
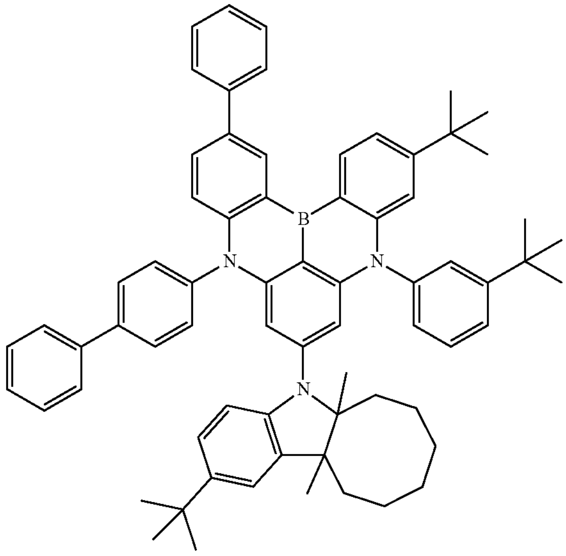
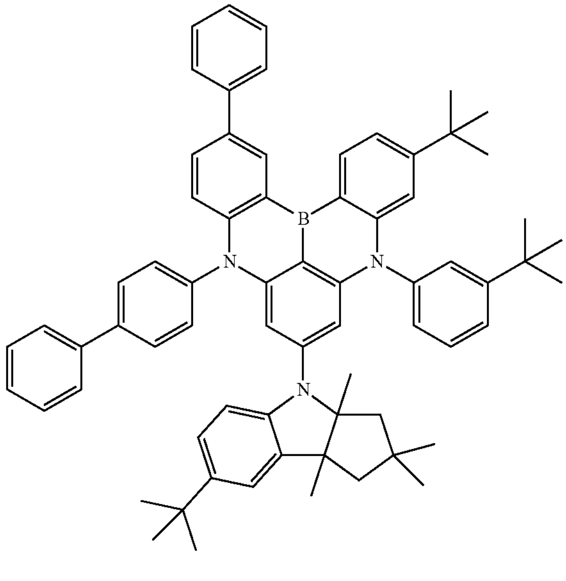

-continued
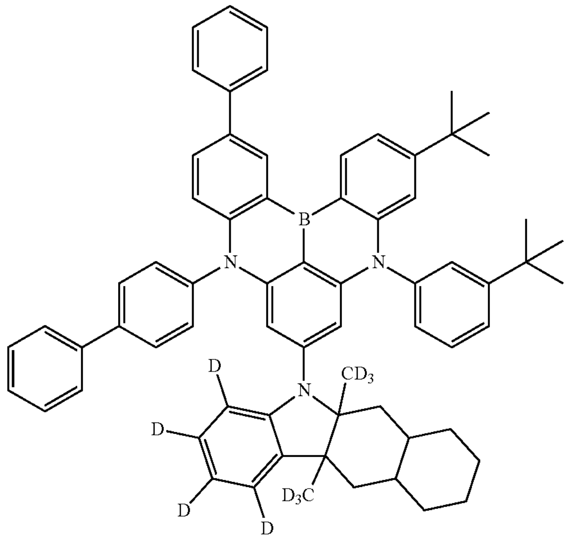
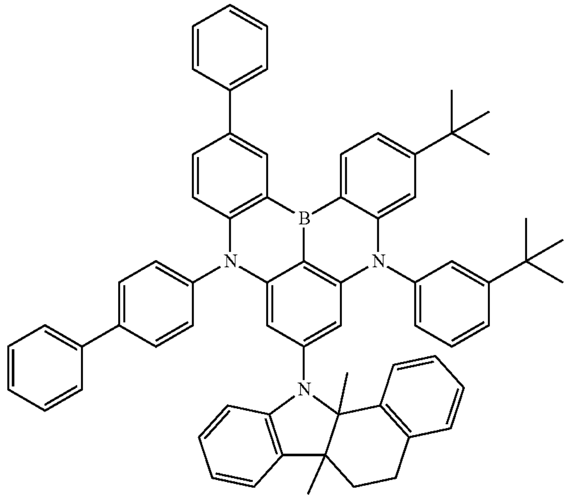
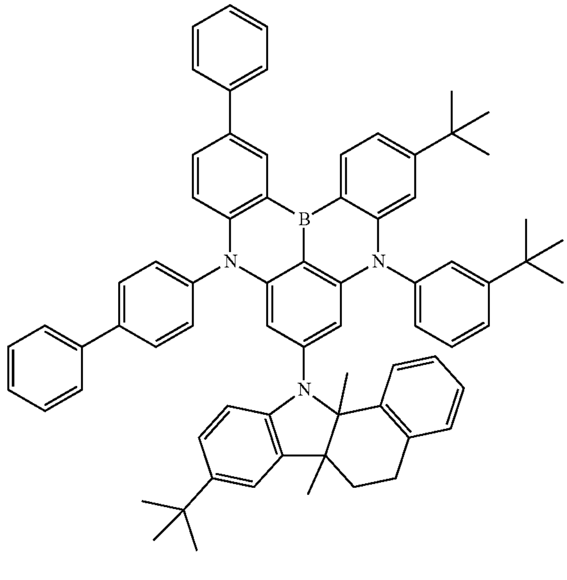
-continued
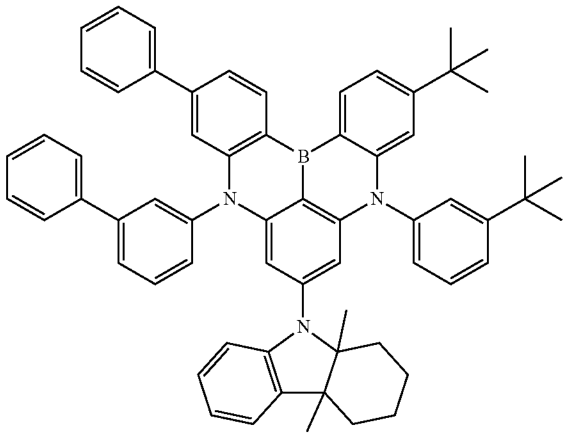
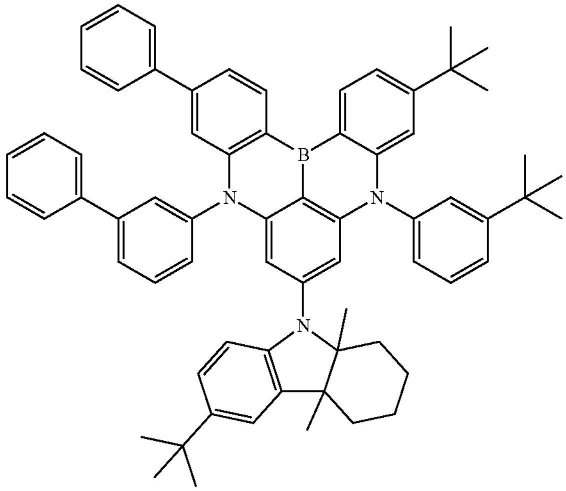
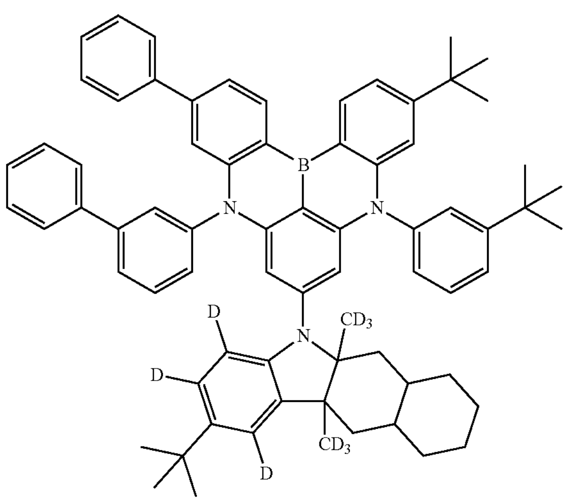

-continued
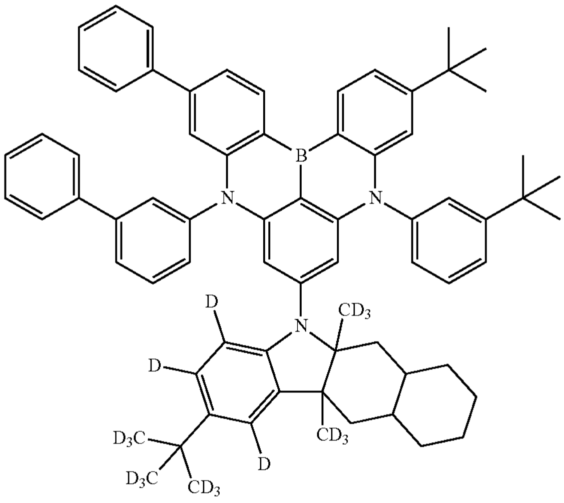
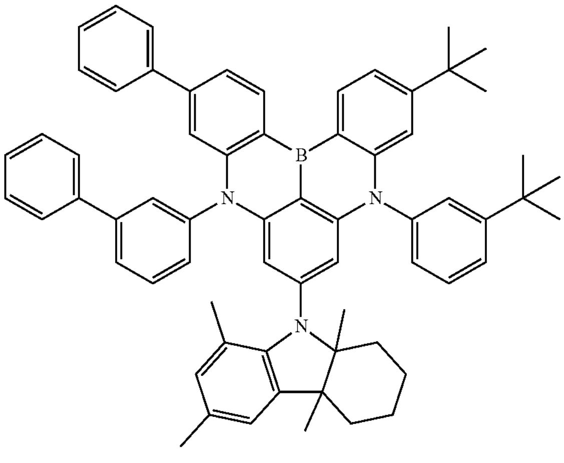
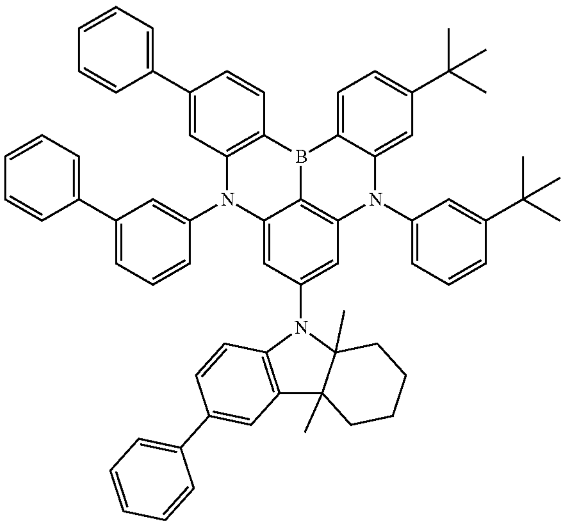
-continued
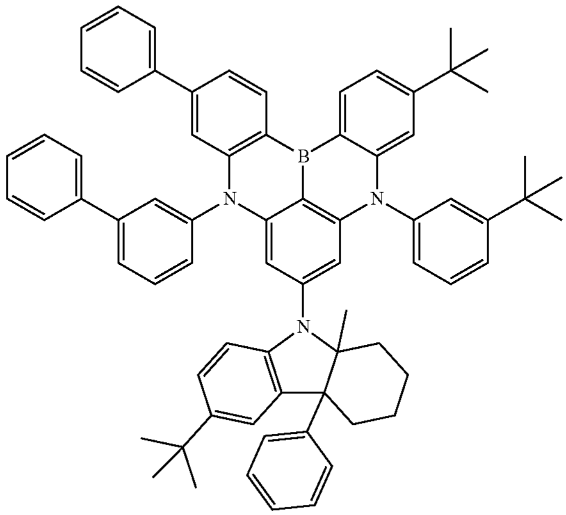
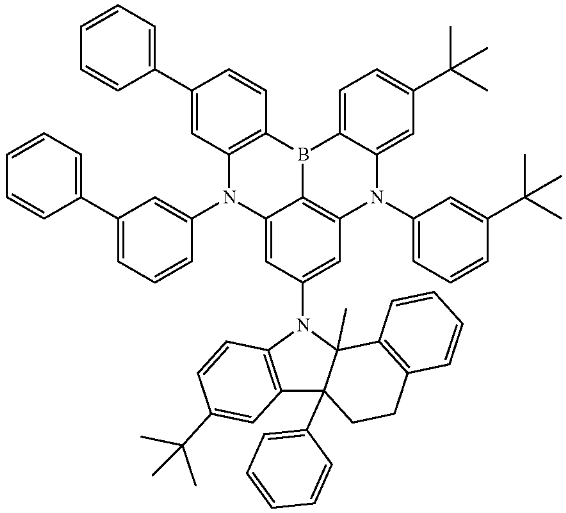
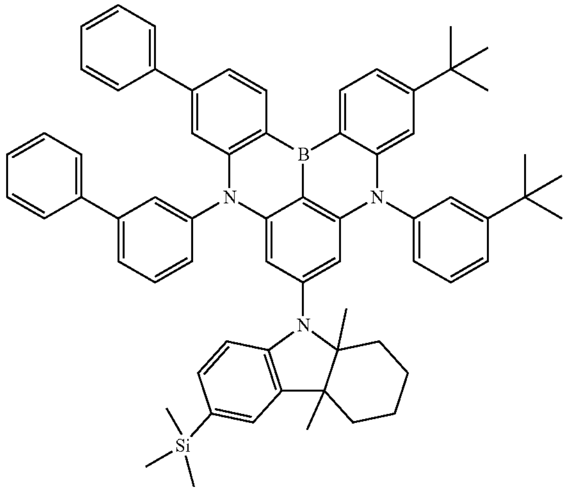

-continued
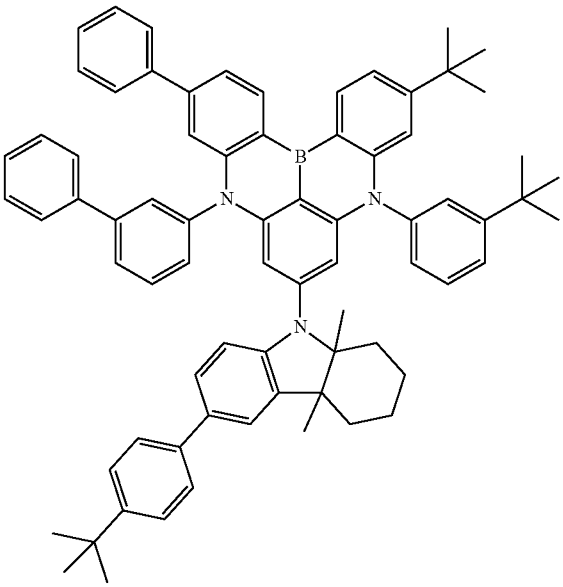
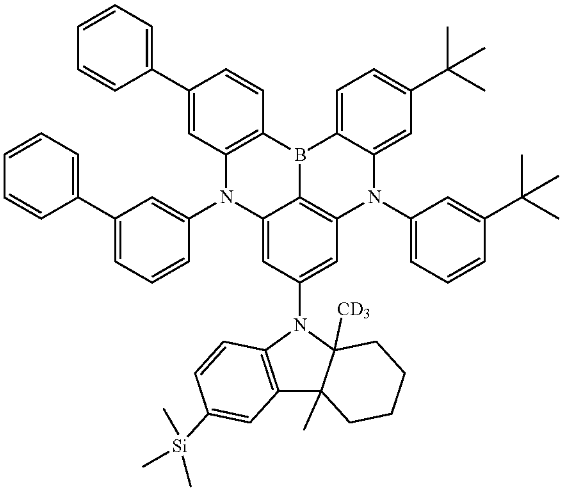
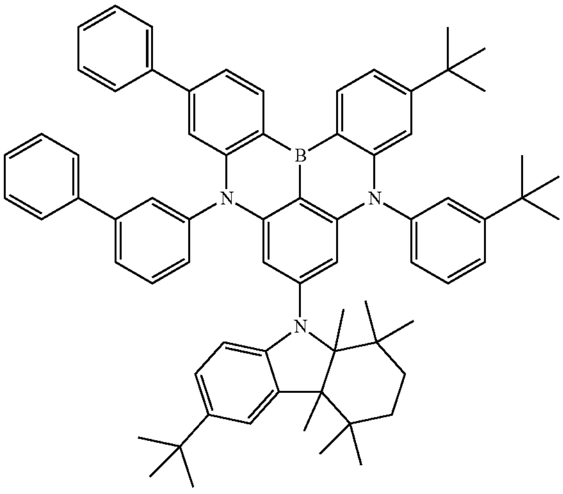
-continued
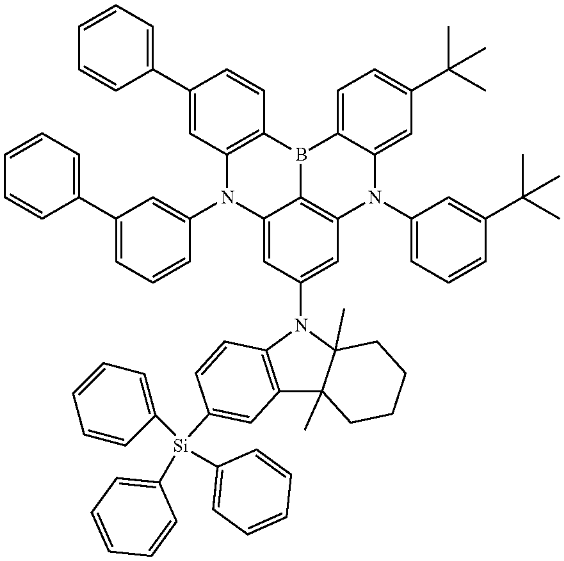
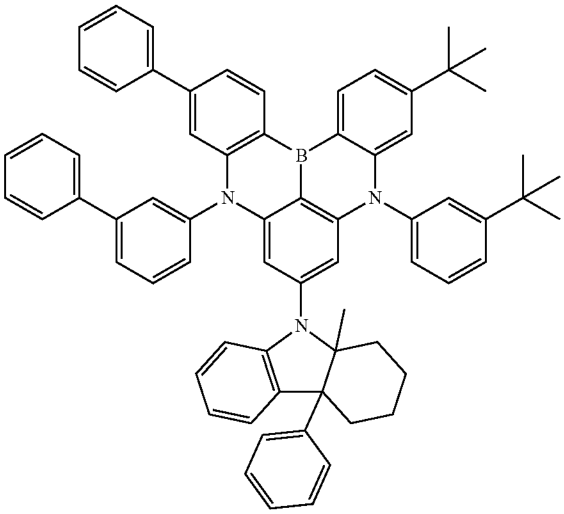
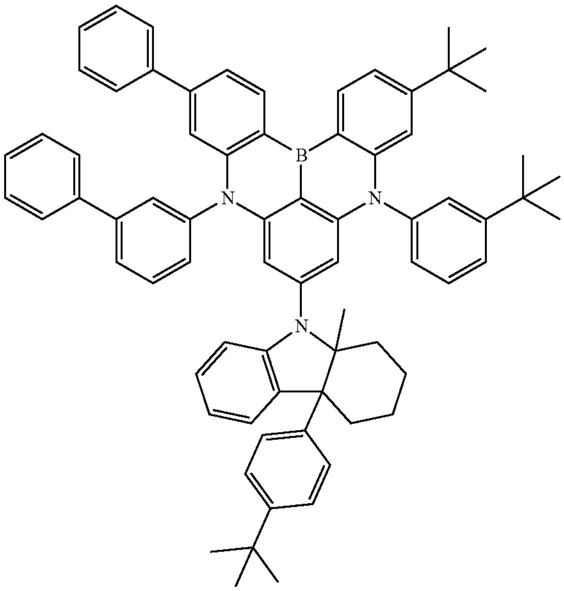

-continued
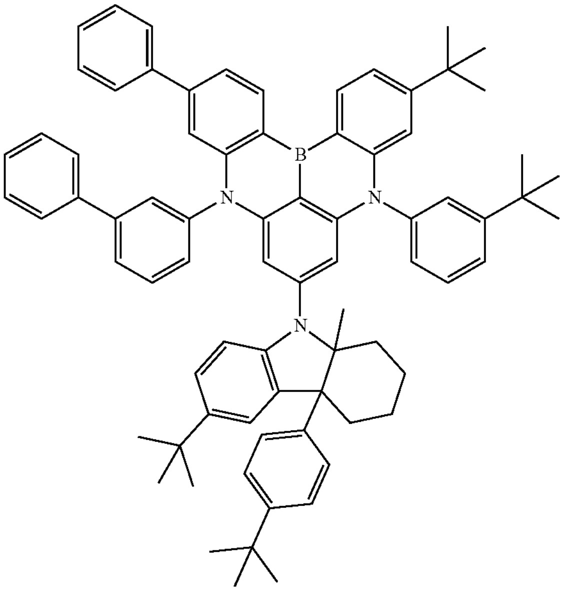
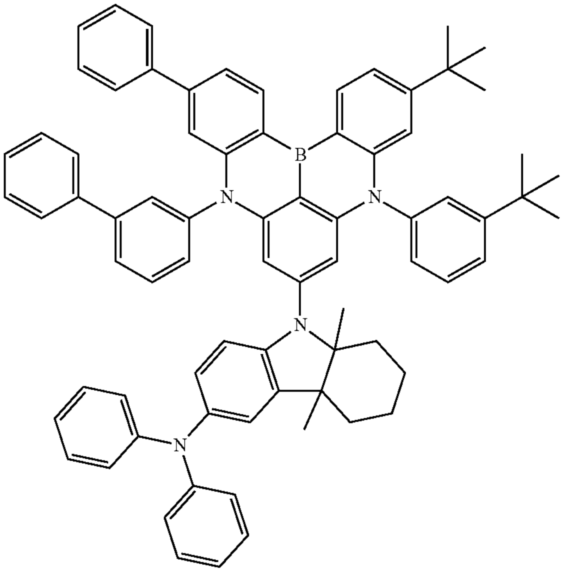
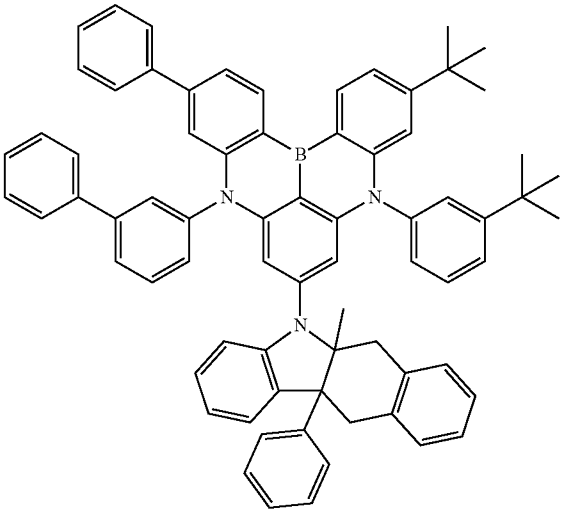
-continued
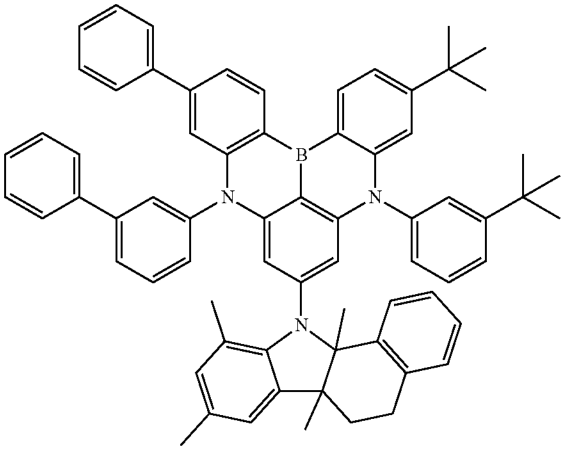
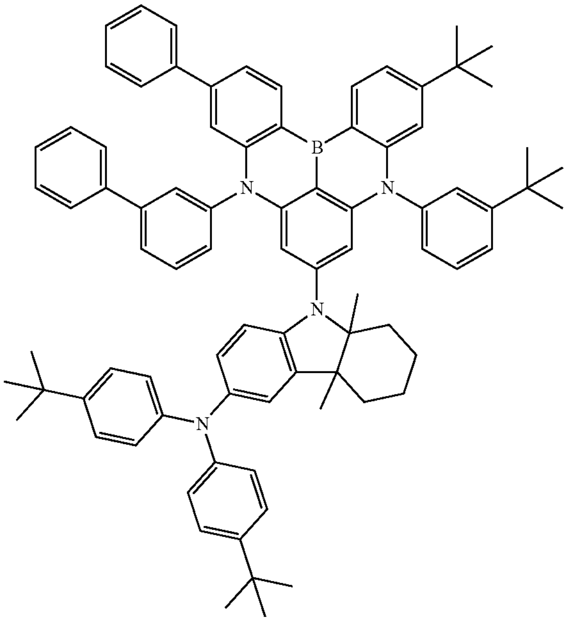
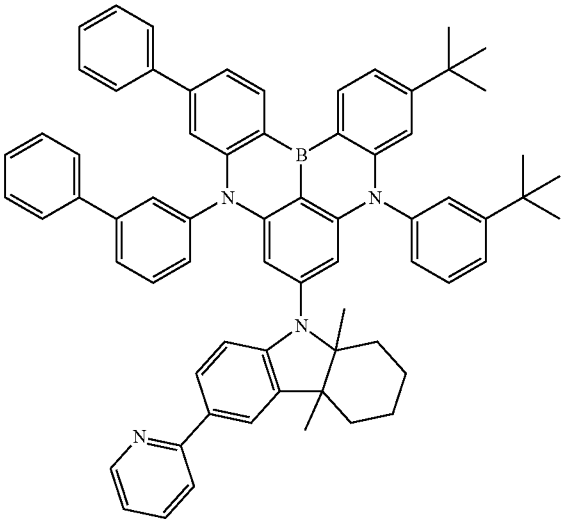

-continued
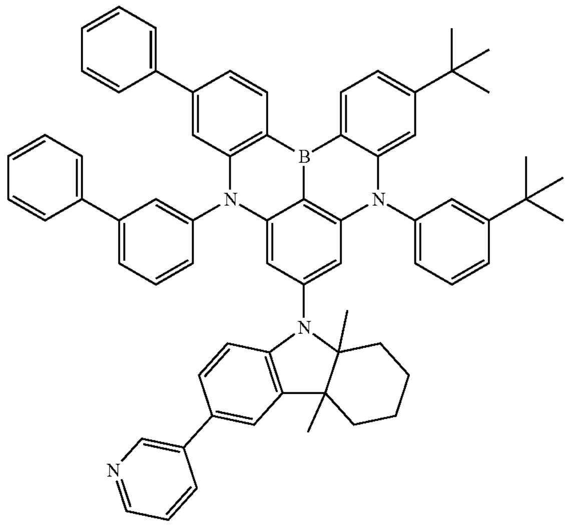
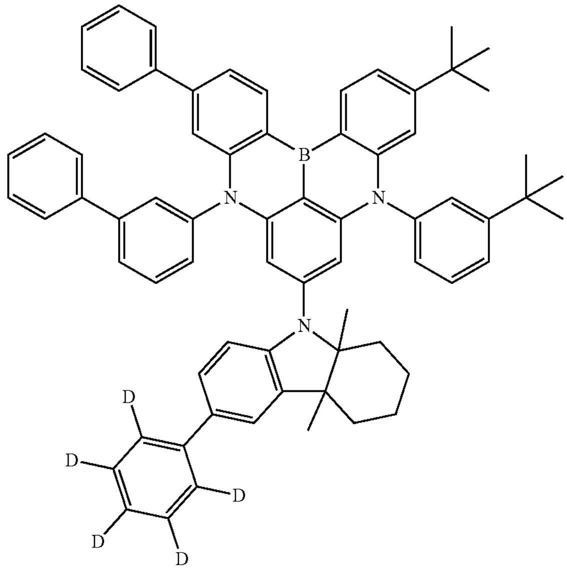
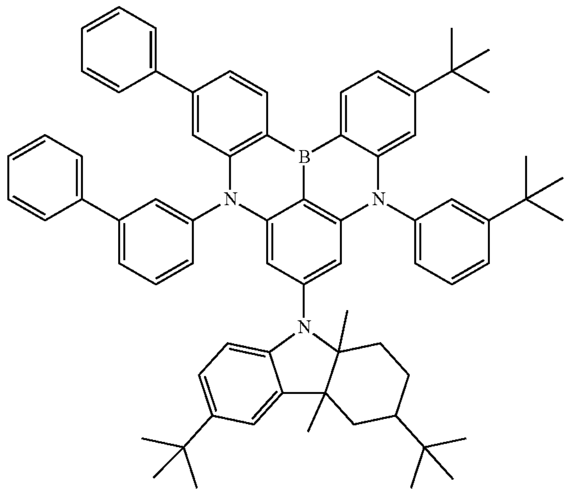
-continued
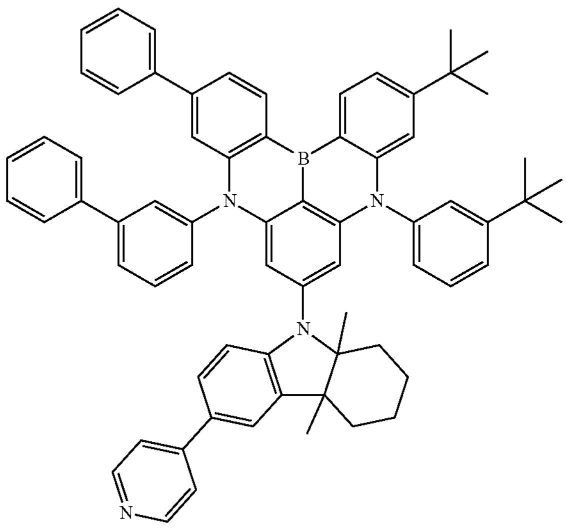
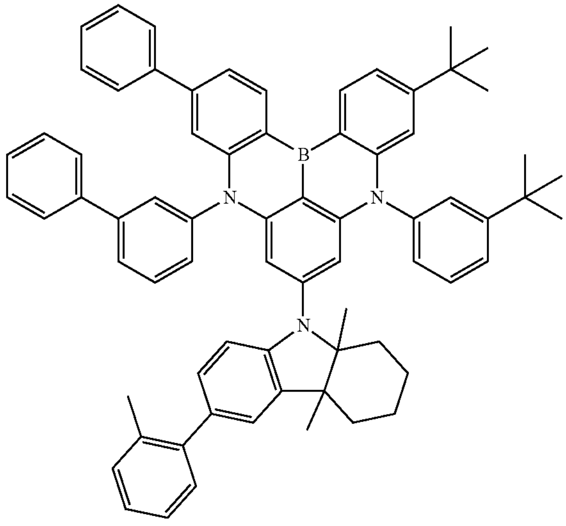
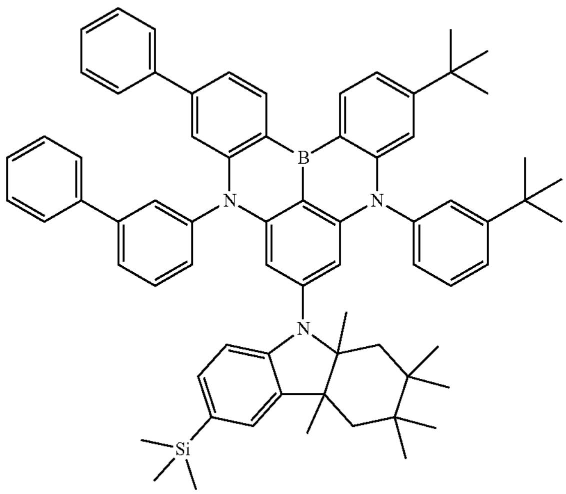

-continued
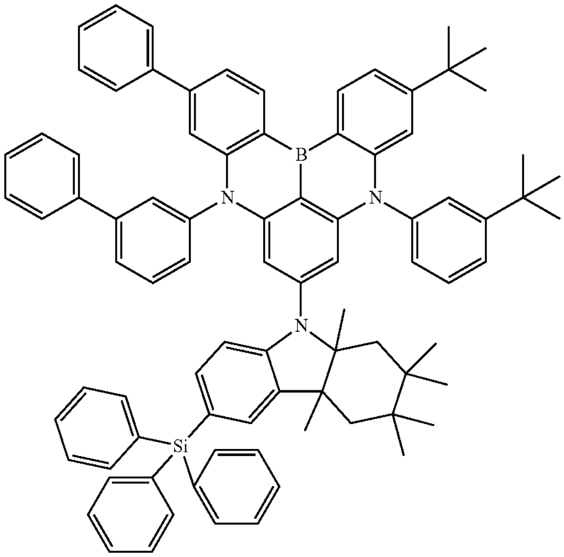
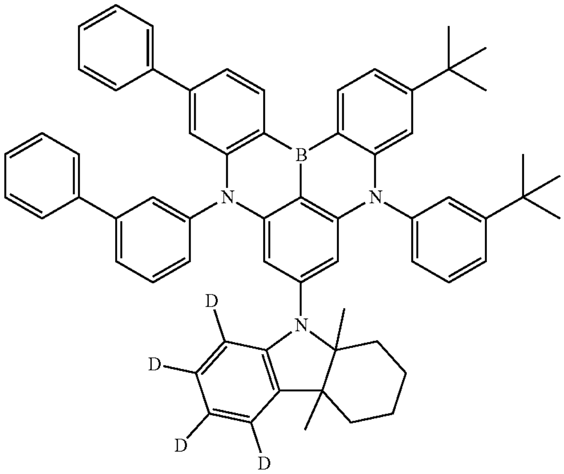
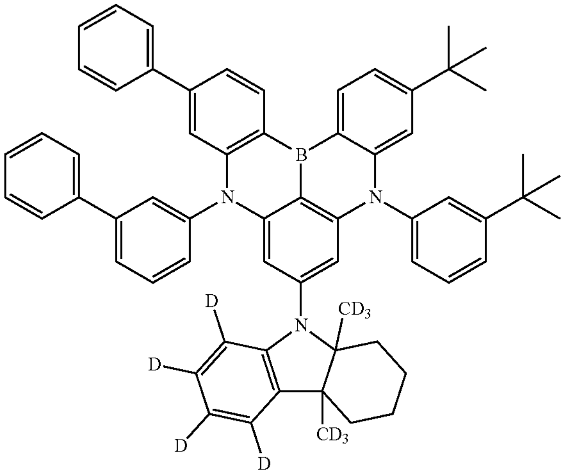
-continued
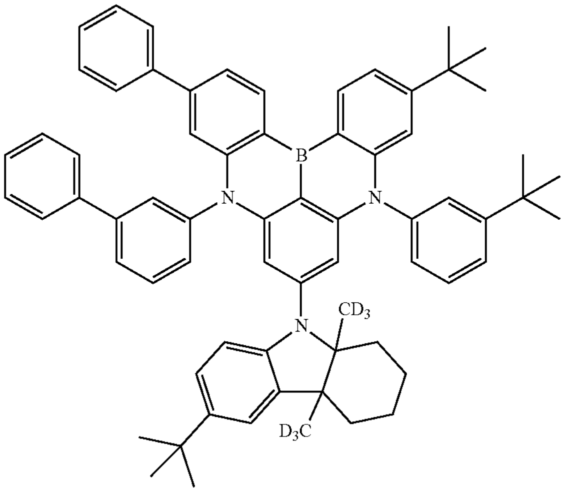
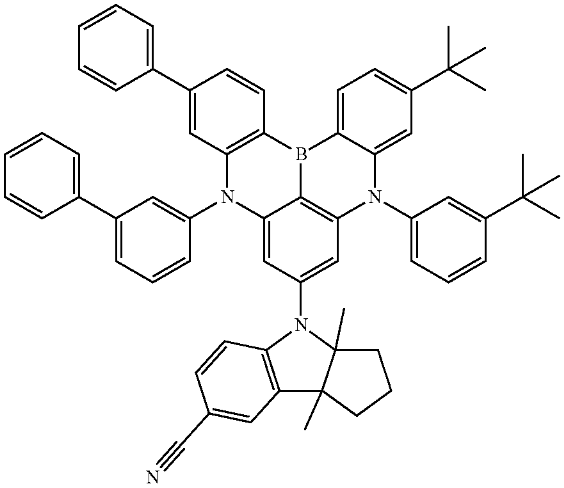
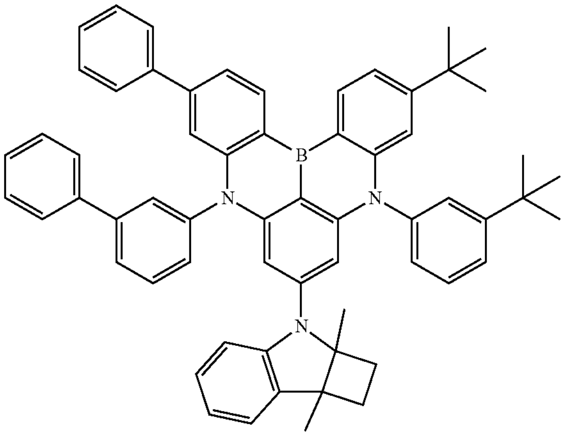

-continued
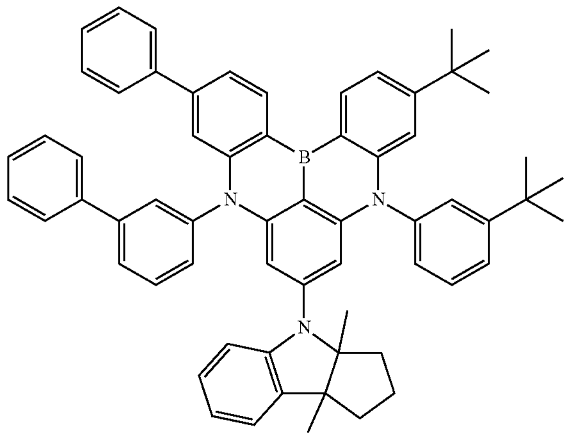
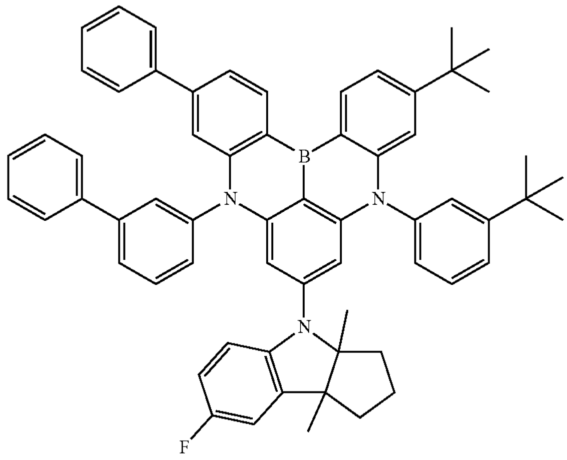
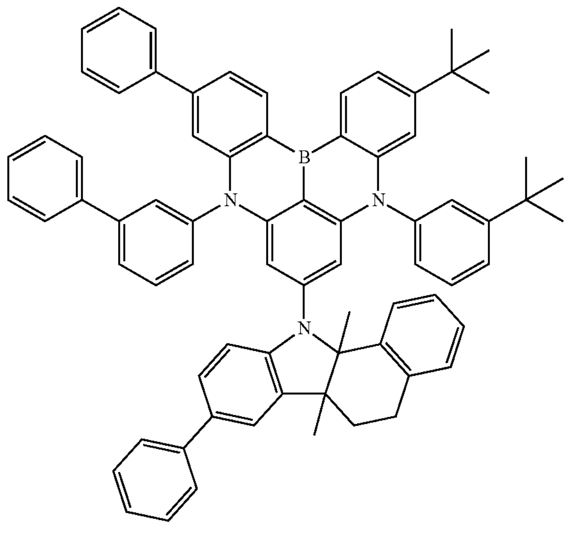
-continued
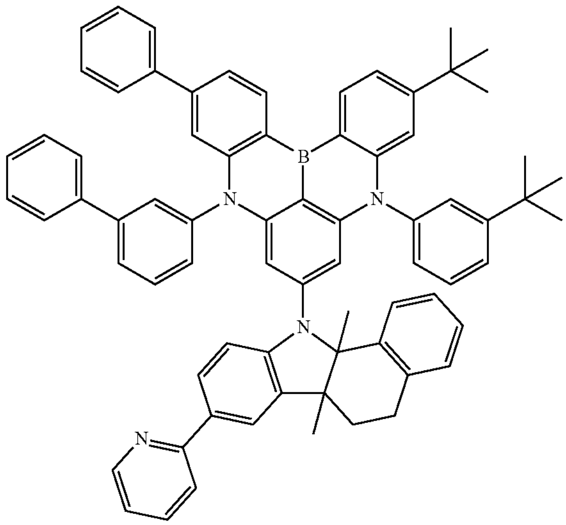
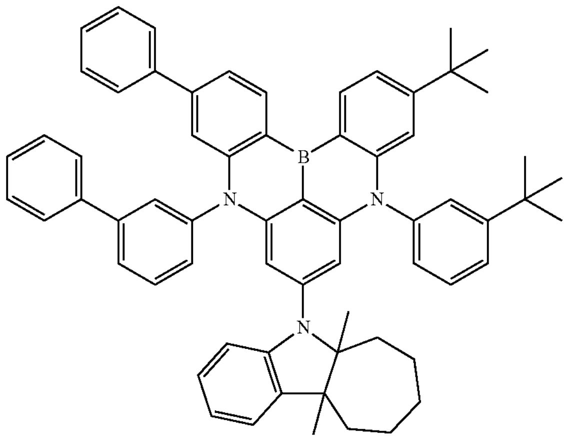
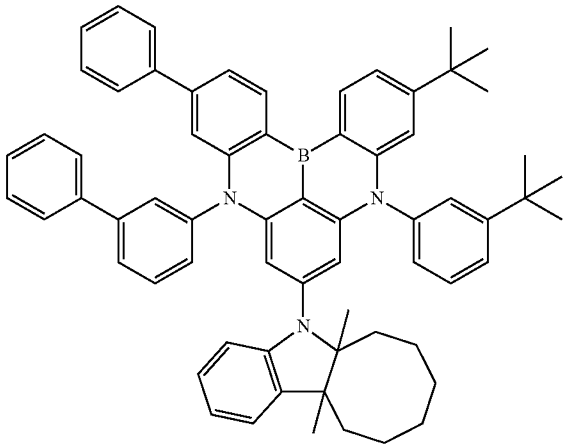

-continued
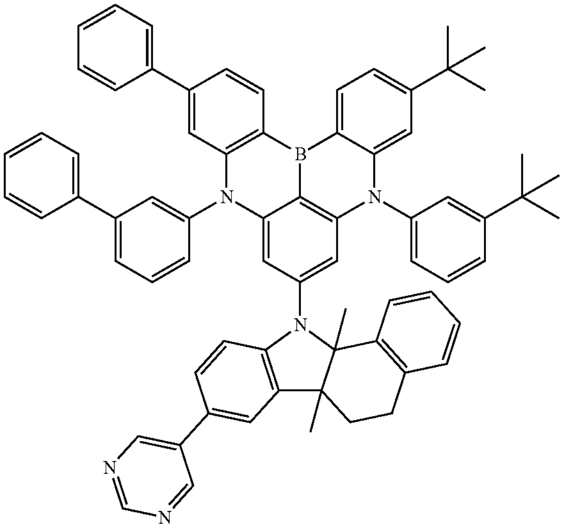
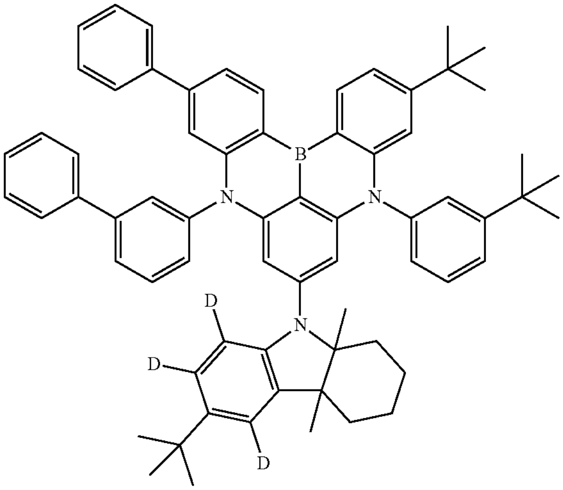
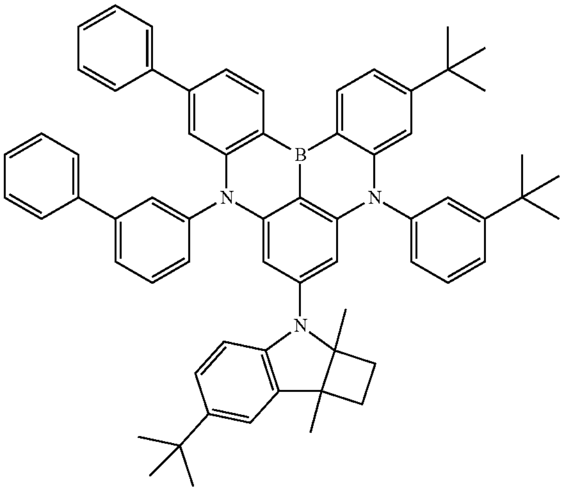
-continued
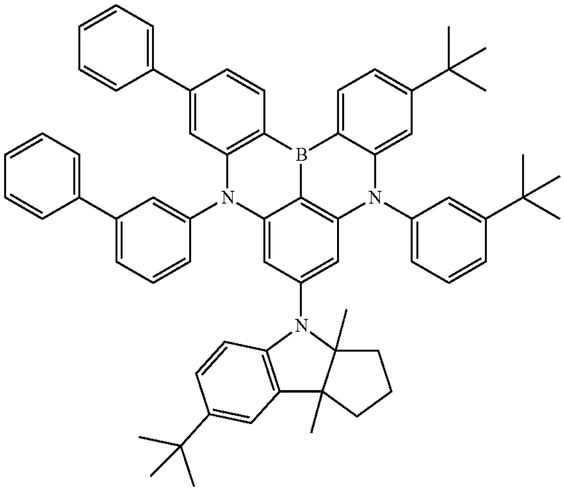
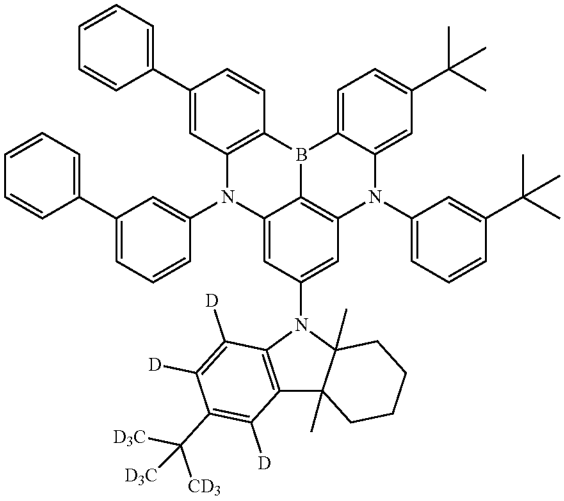
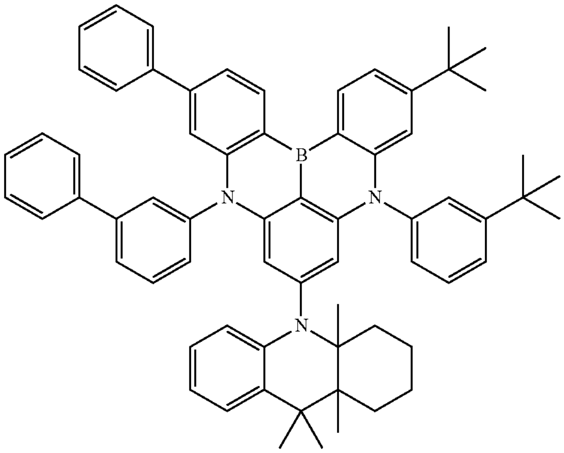

-continued
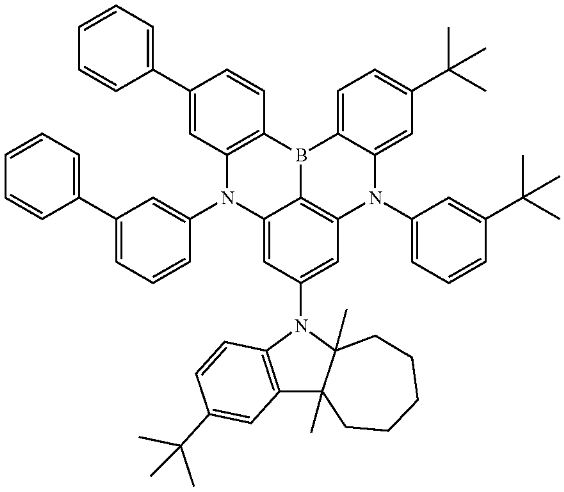
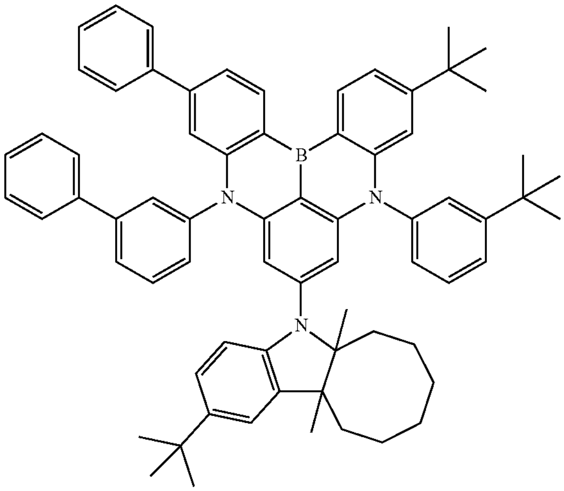
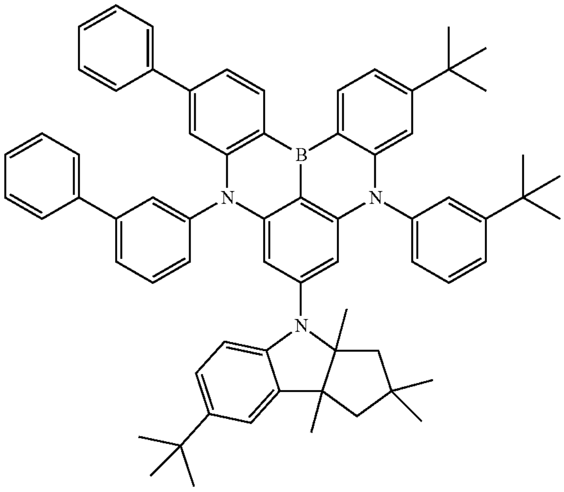
-continued
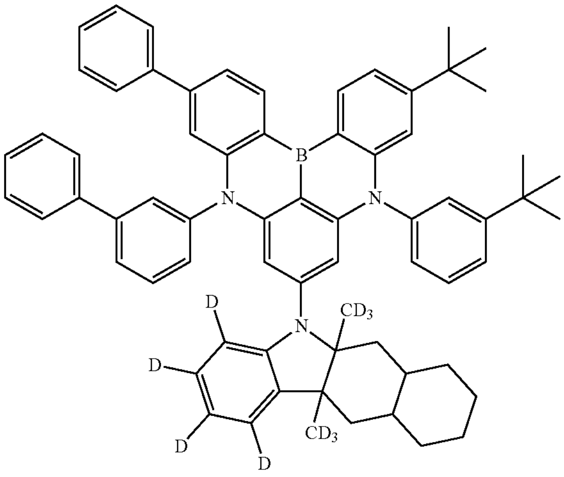
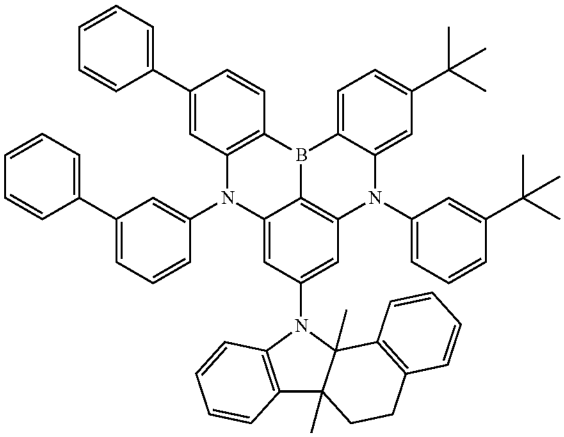
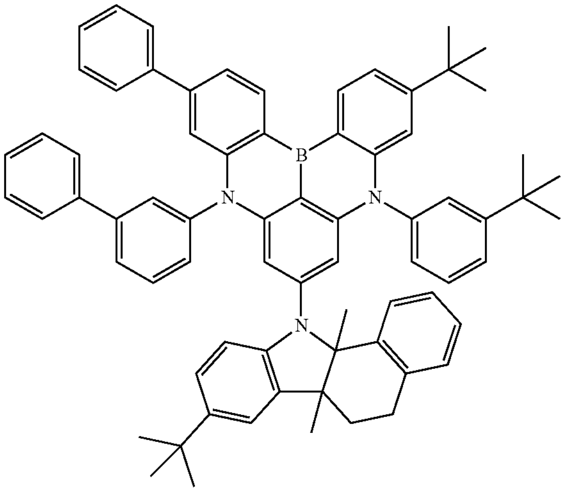

-continued
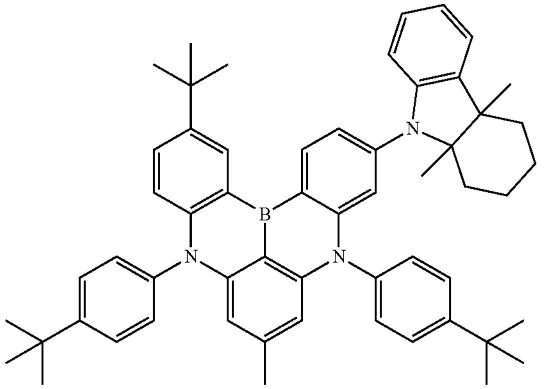
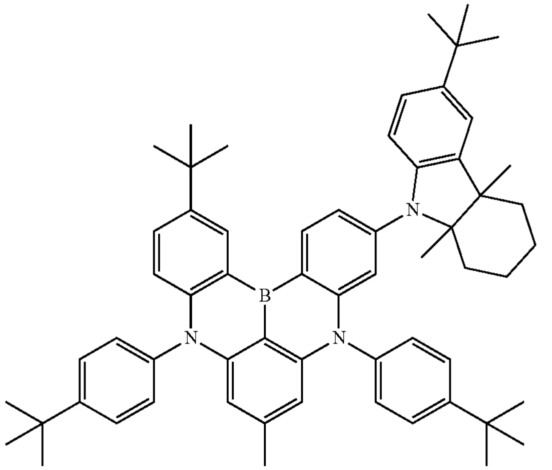
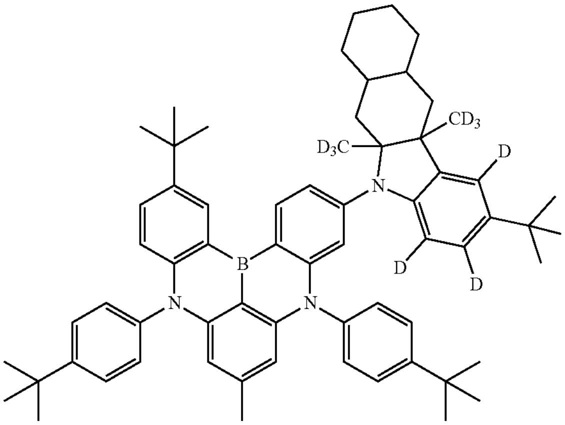
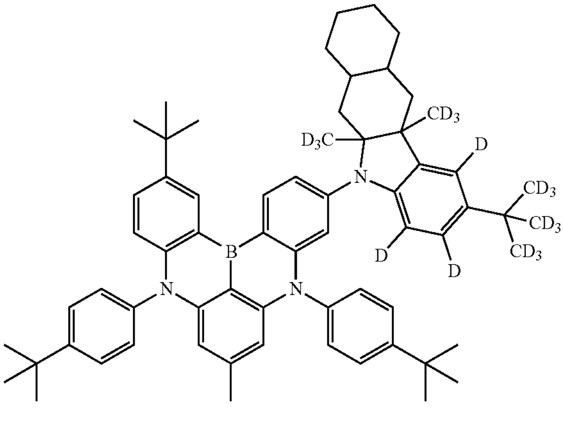
-continued
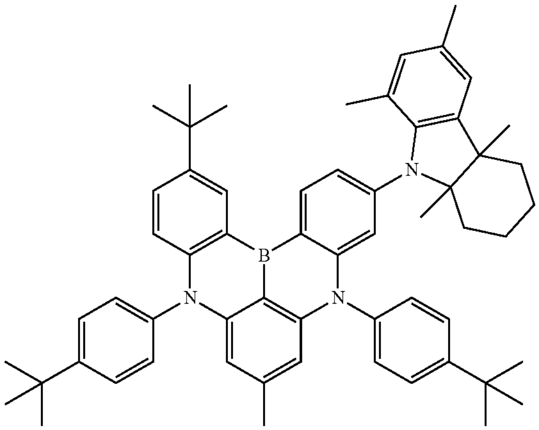
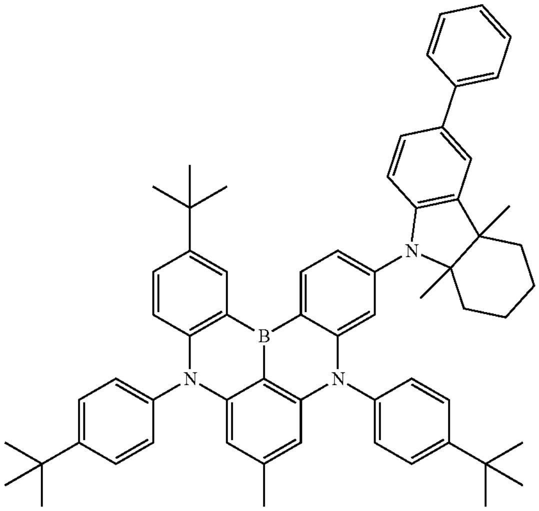
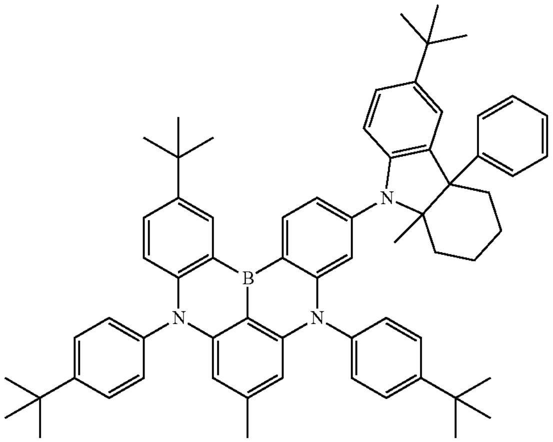

3401
-continued
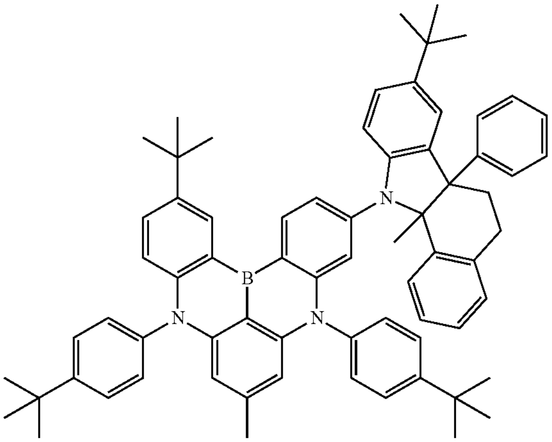
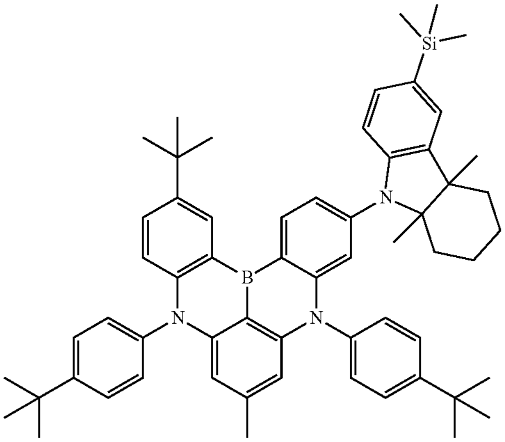
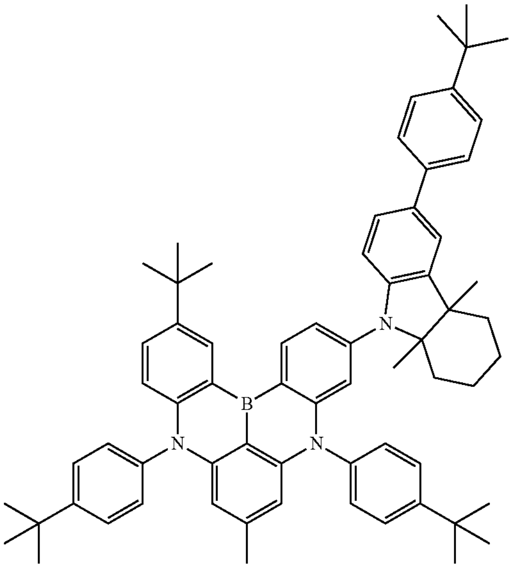
3402
-continued
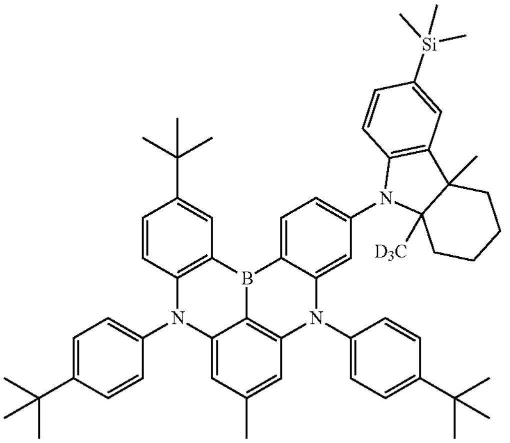
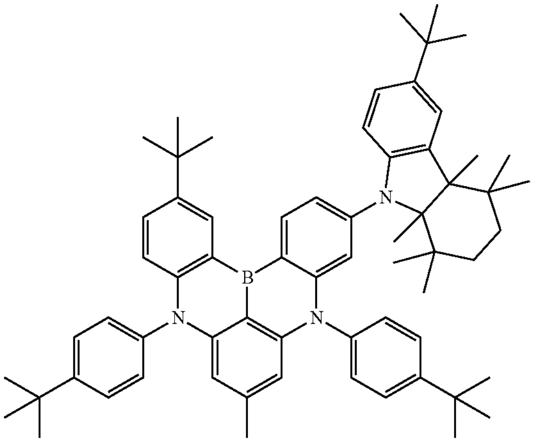
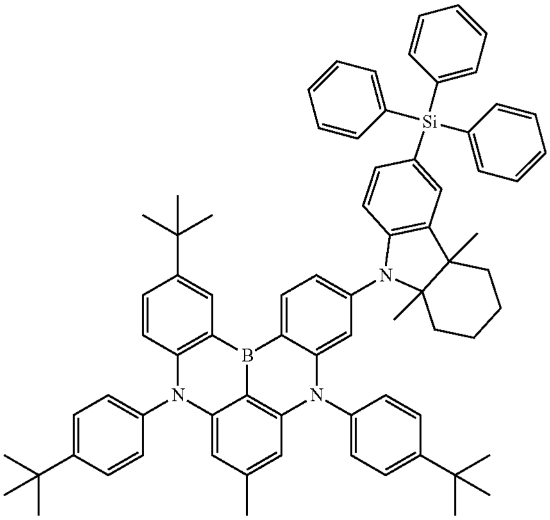

-continued
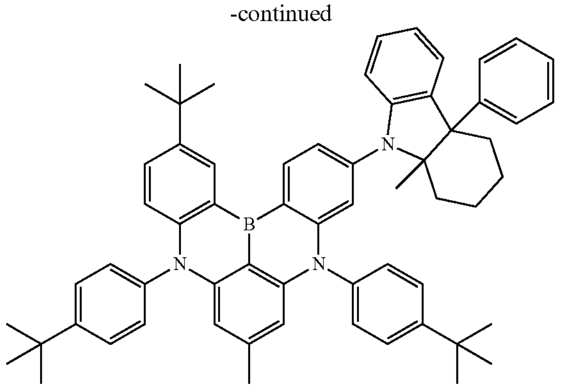
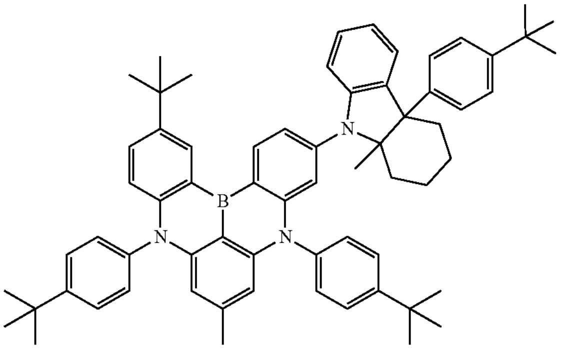
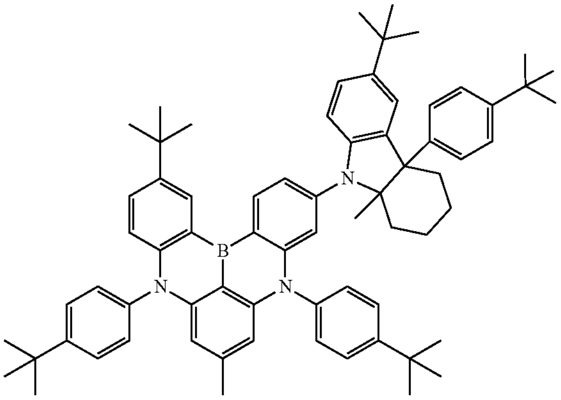
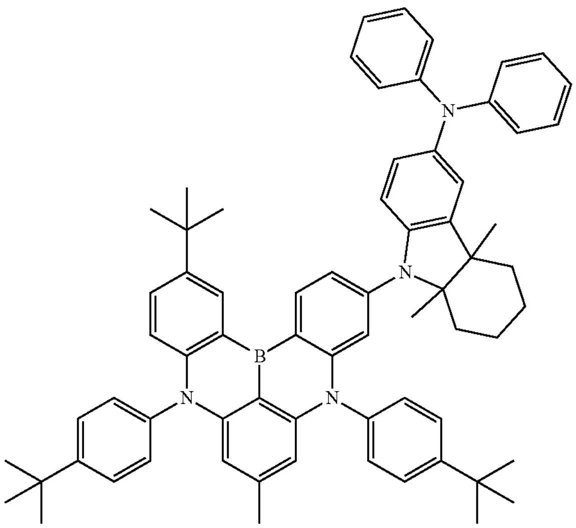
-continued
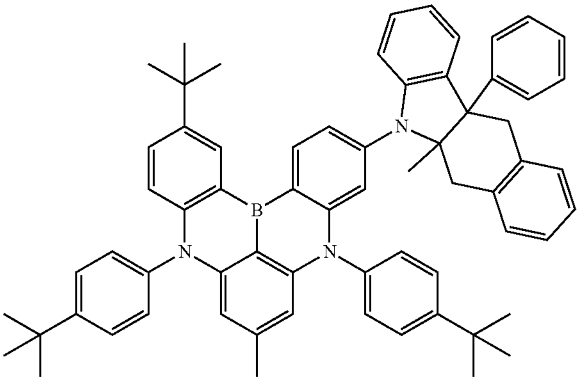
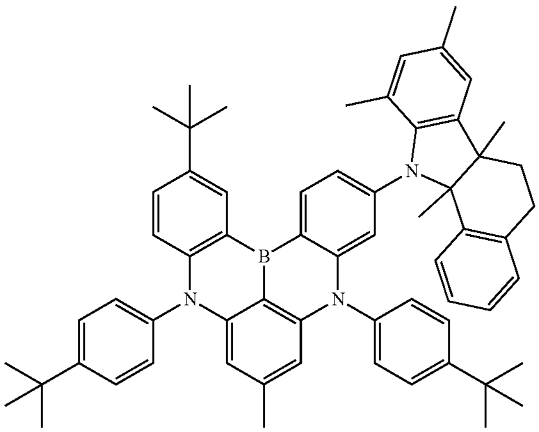
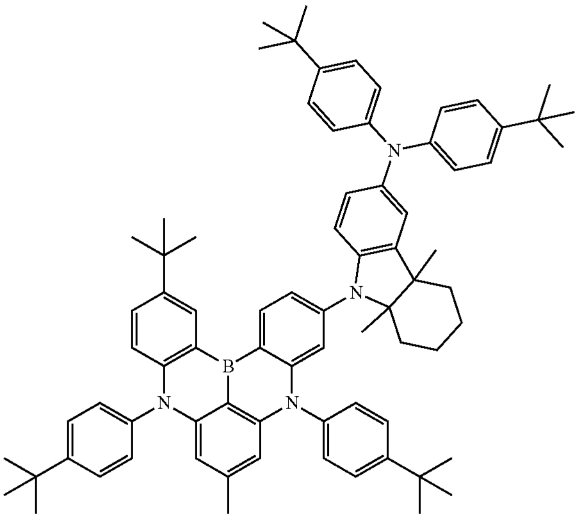

-continued
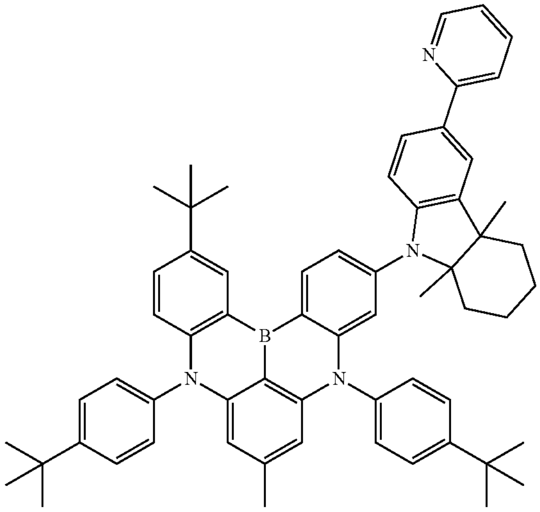
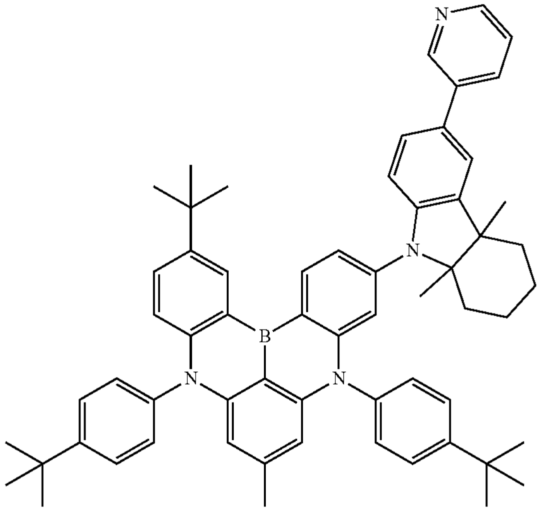
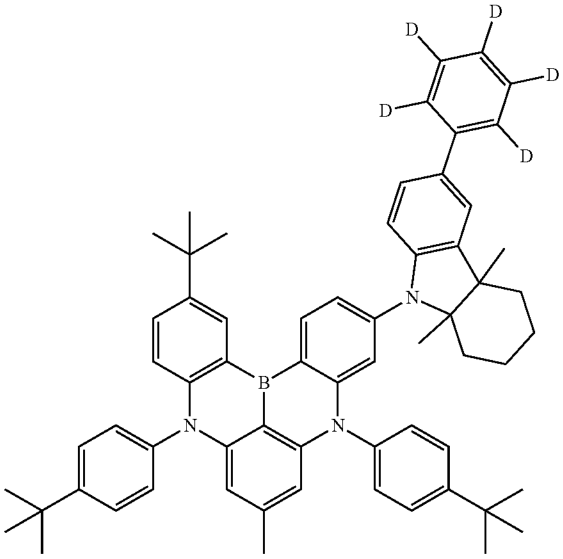
-continued
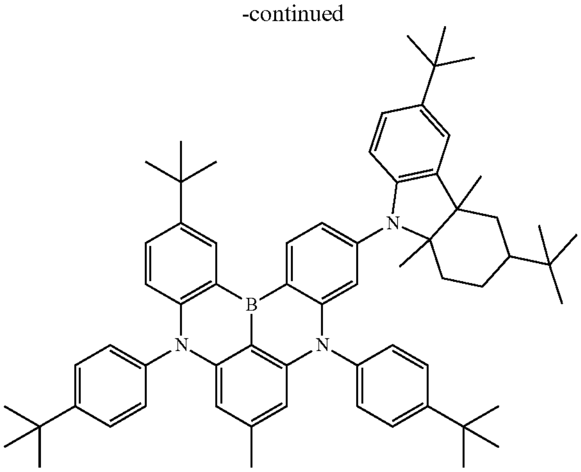
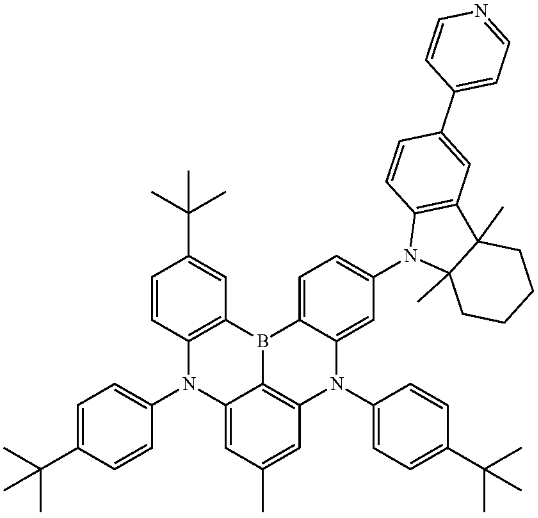
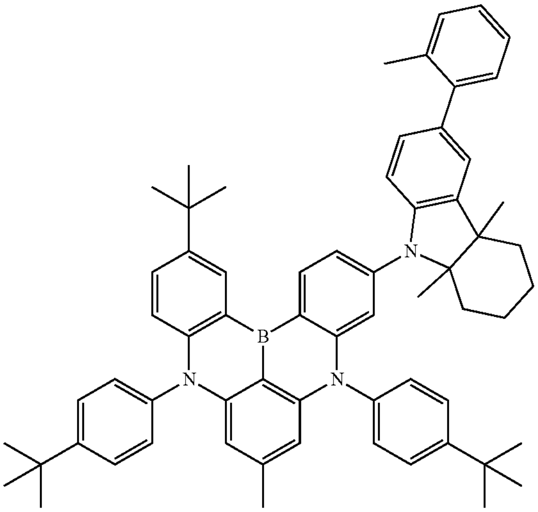

-continued
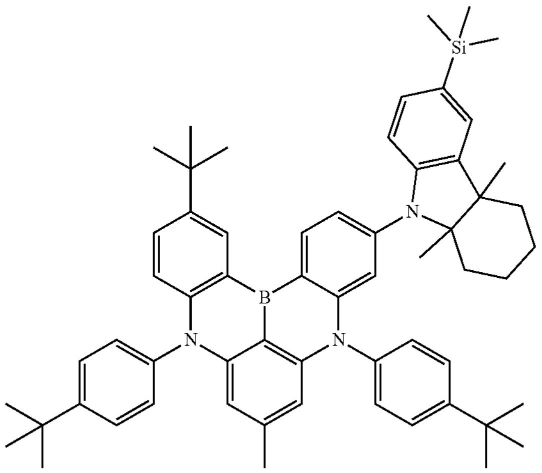
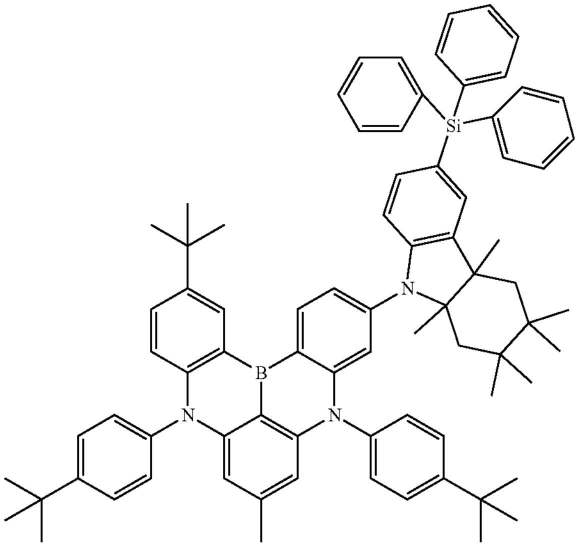
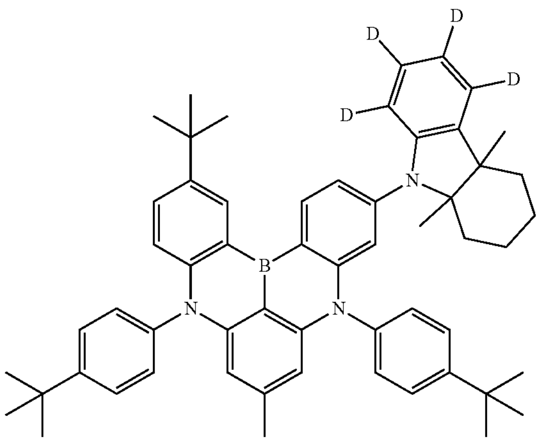
-continued
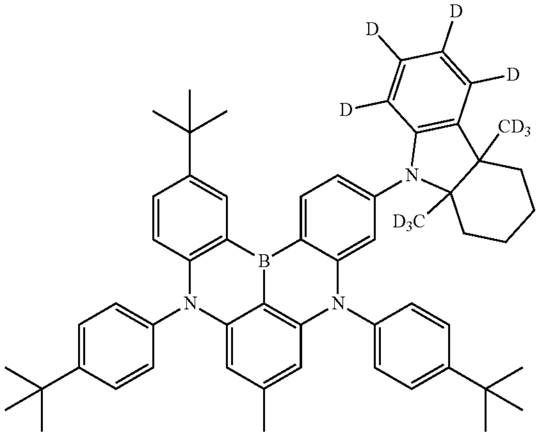
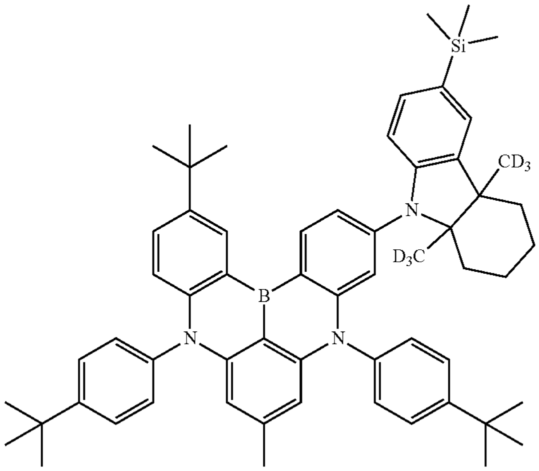
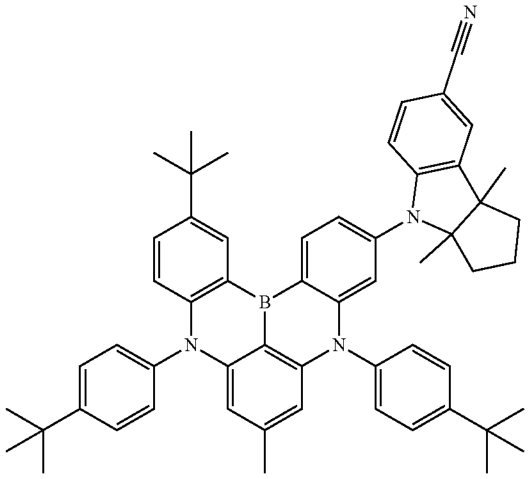

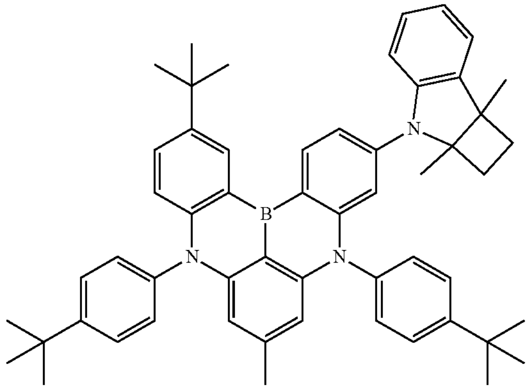
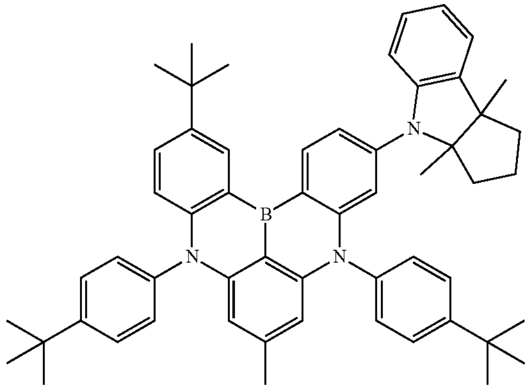
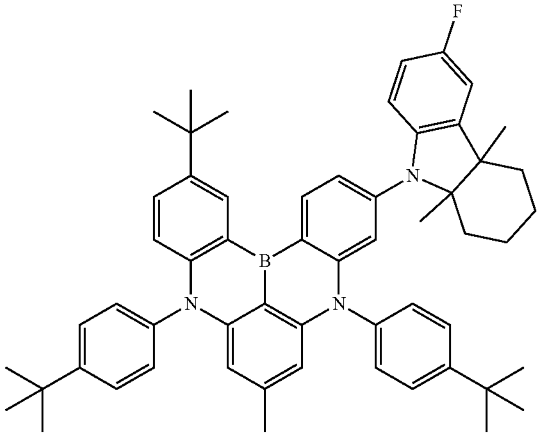
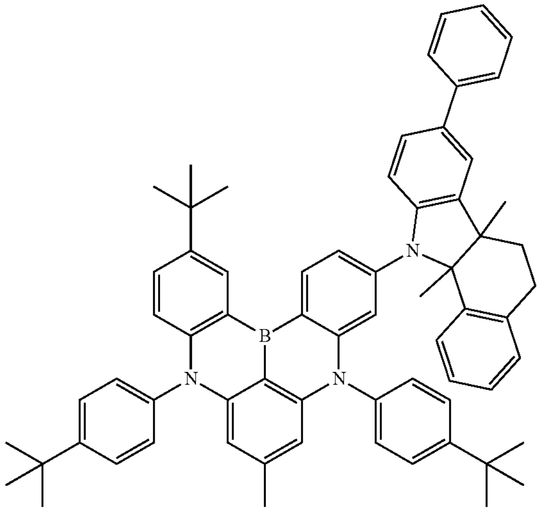
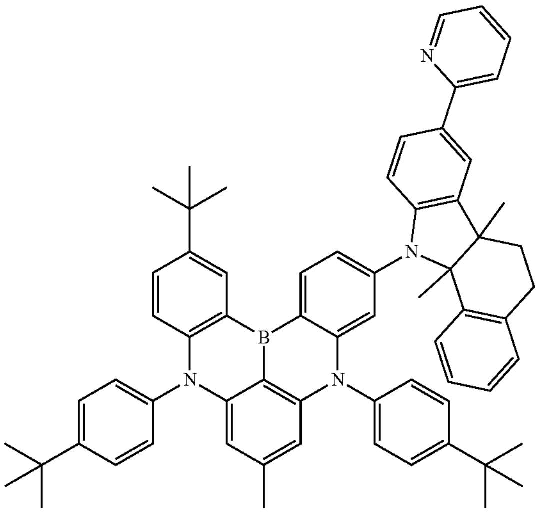
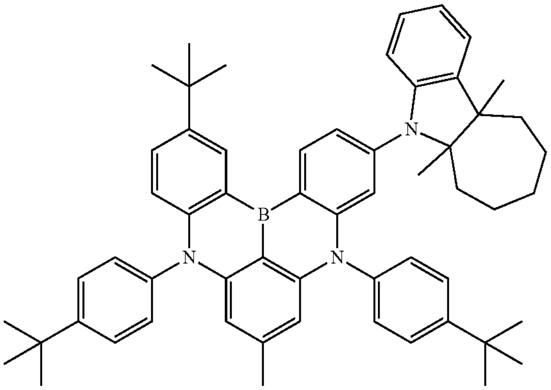
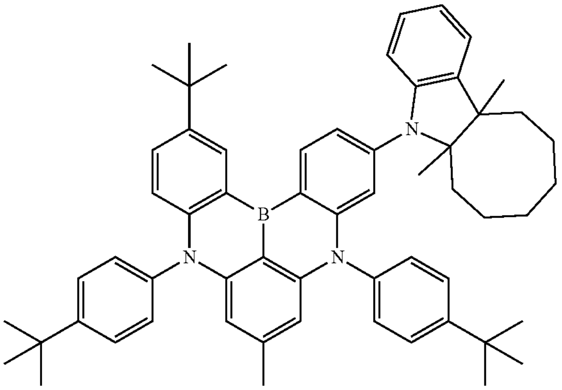

-continued
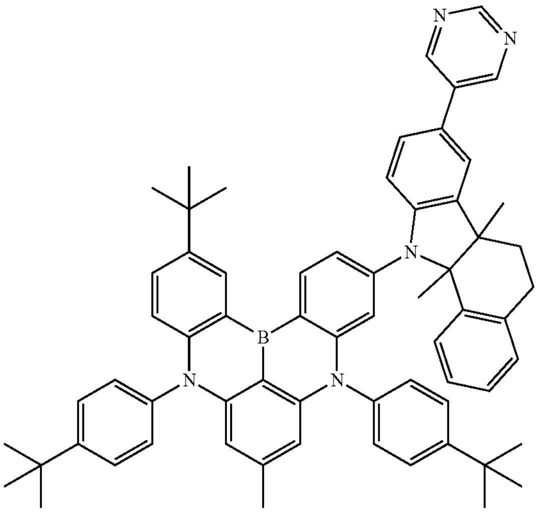
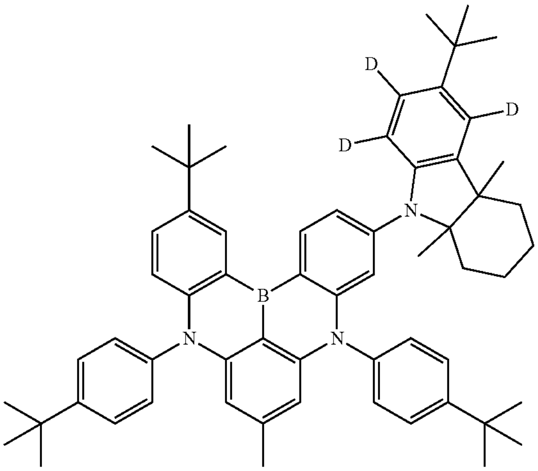
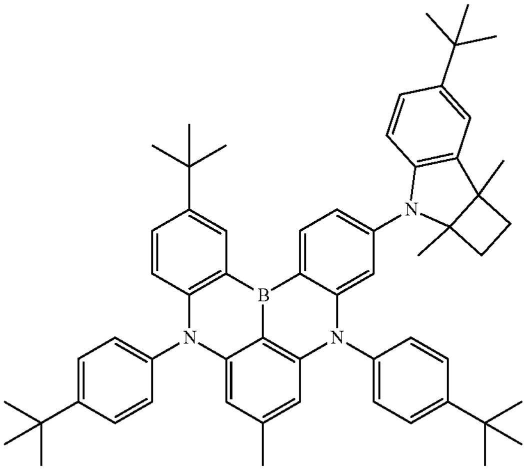
-continued
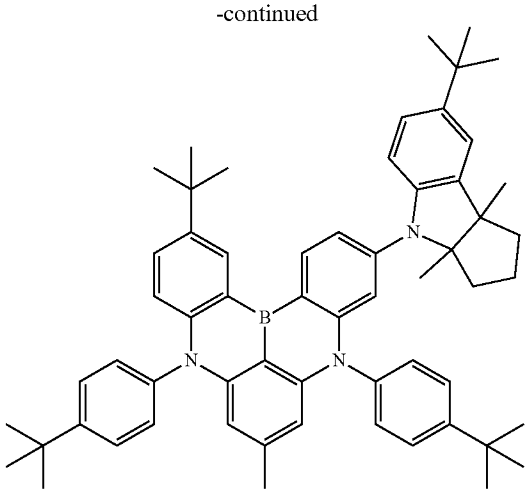
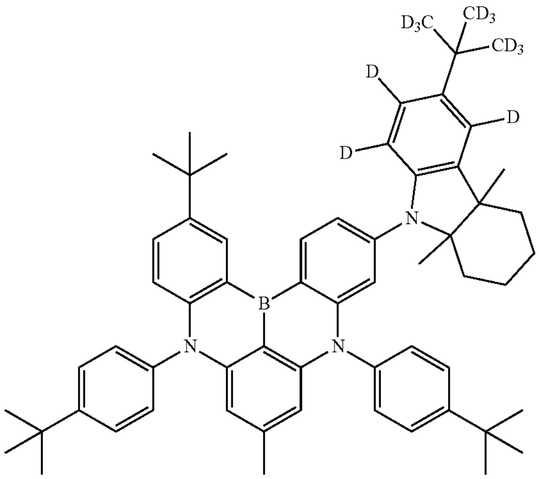
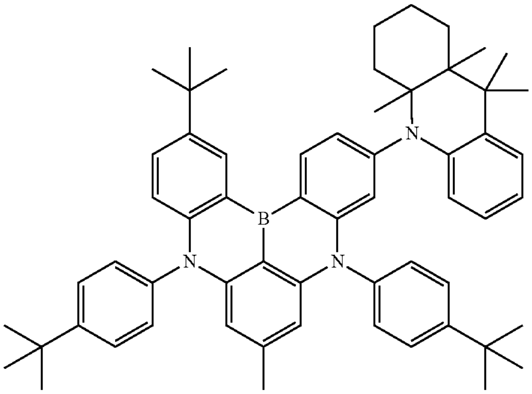

-continued
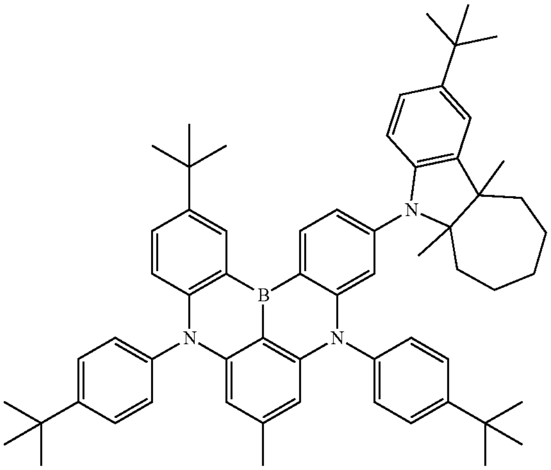
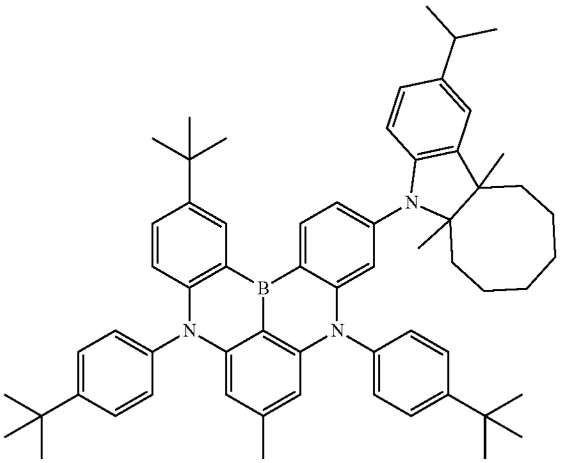
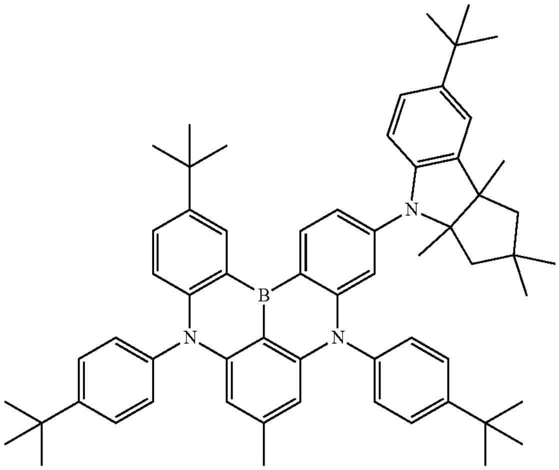
-continued
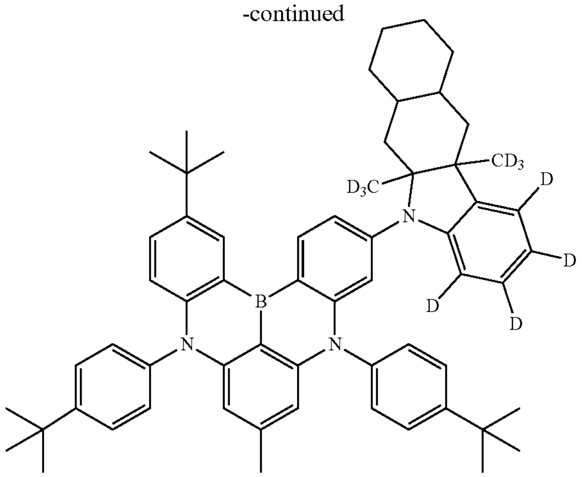
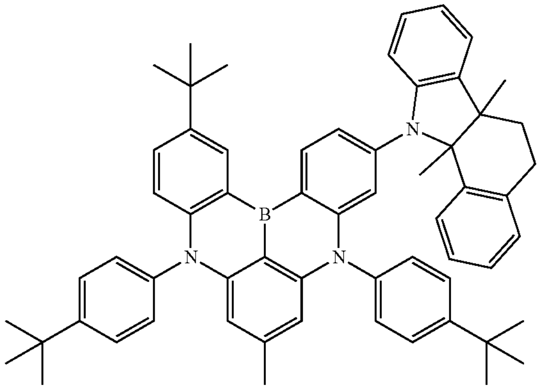
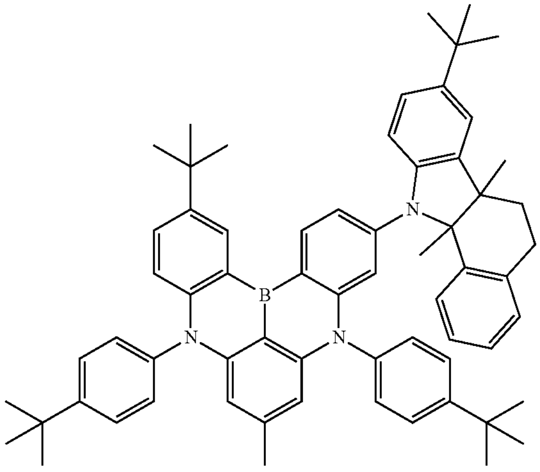
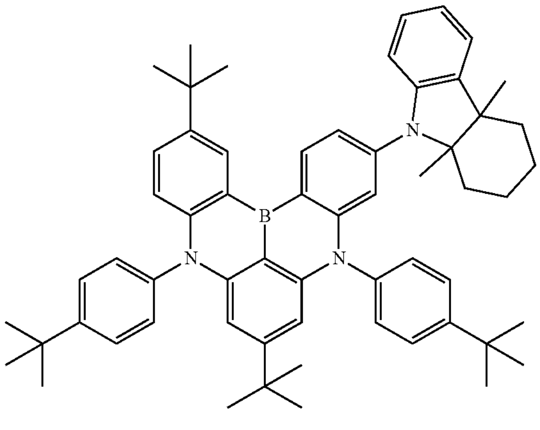

-continued
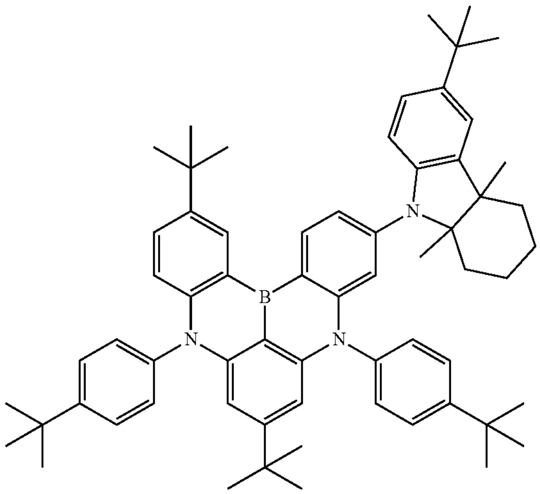
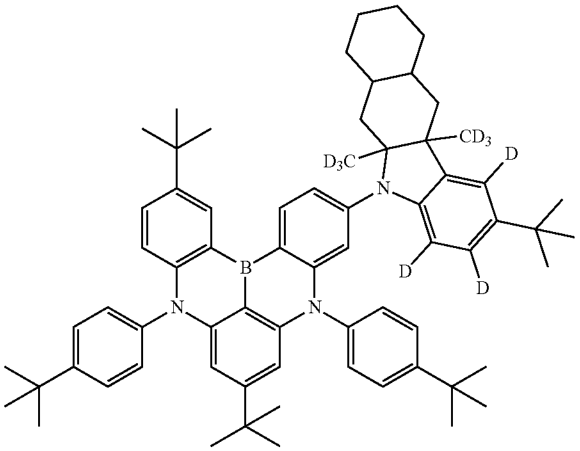
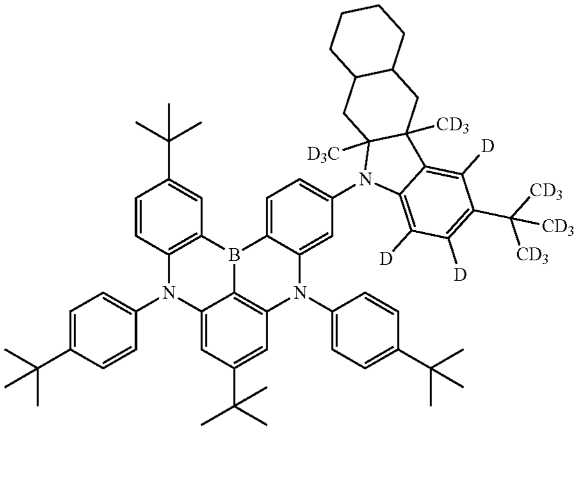
-continued
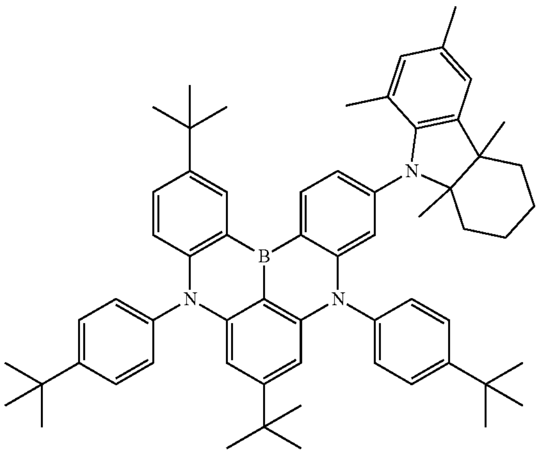
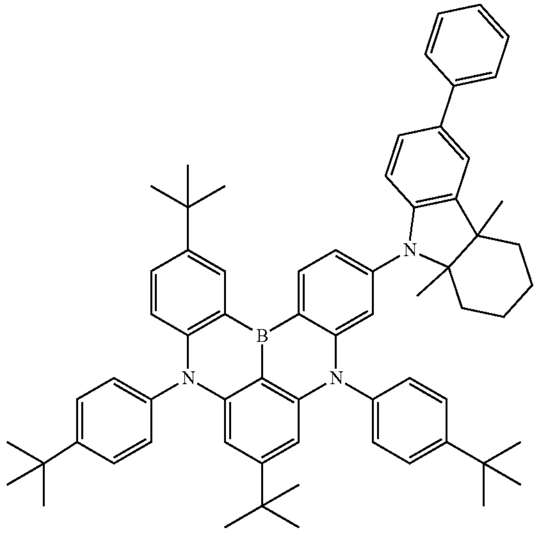
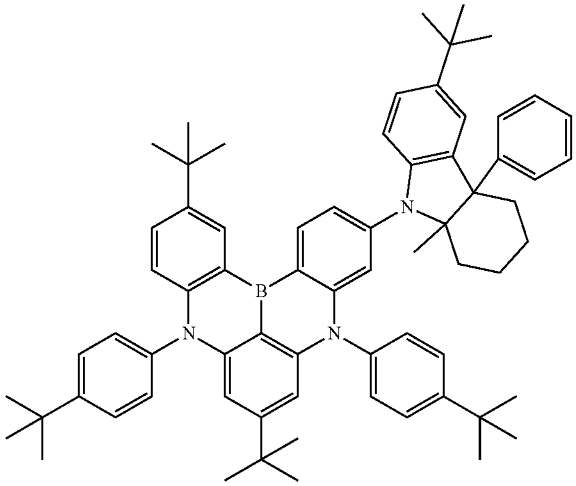

-continued
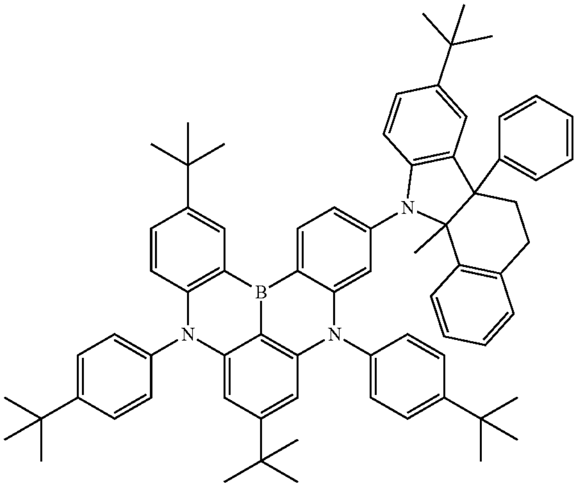
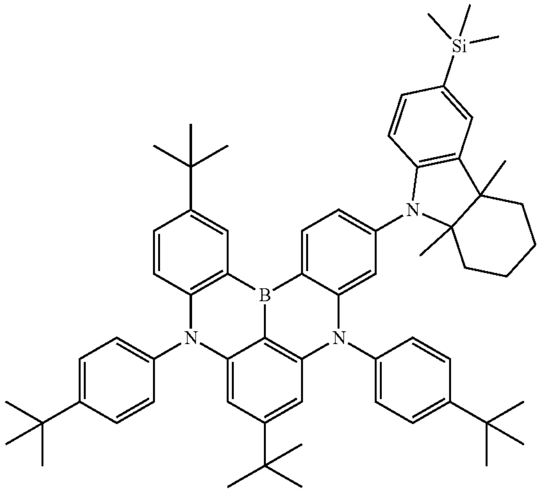
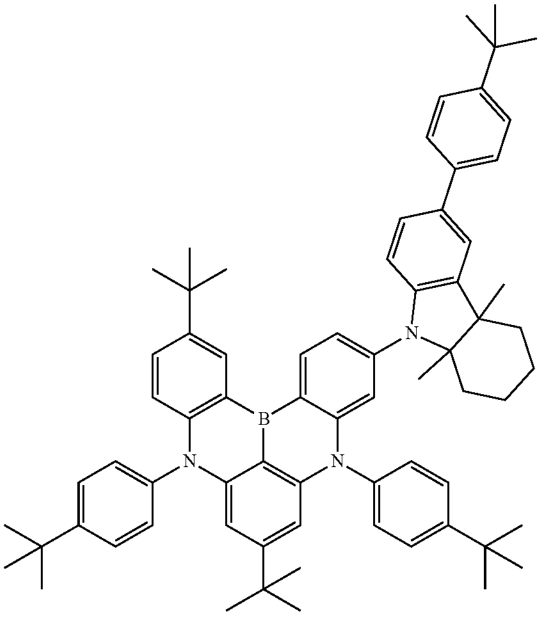
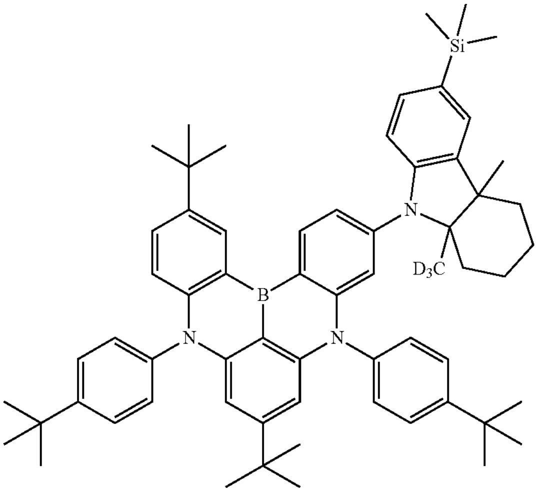
-continued
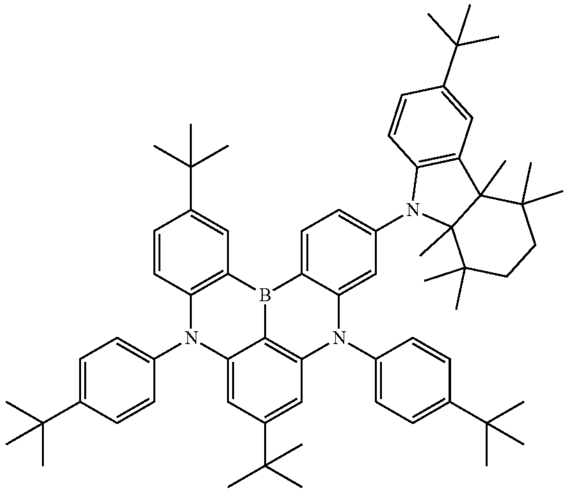
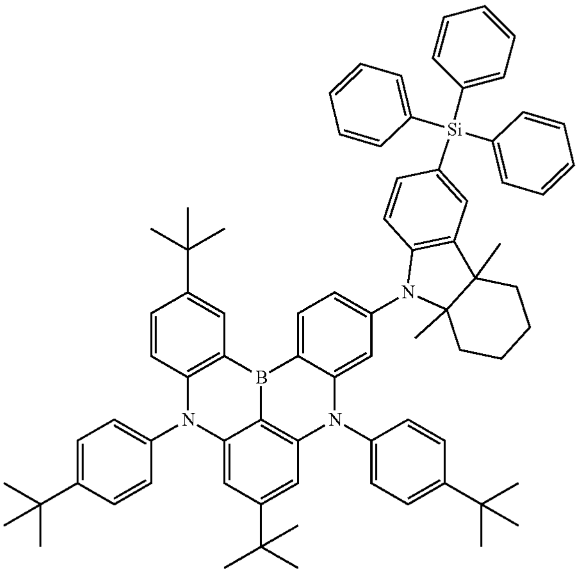

-continued
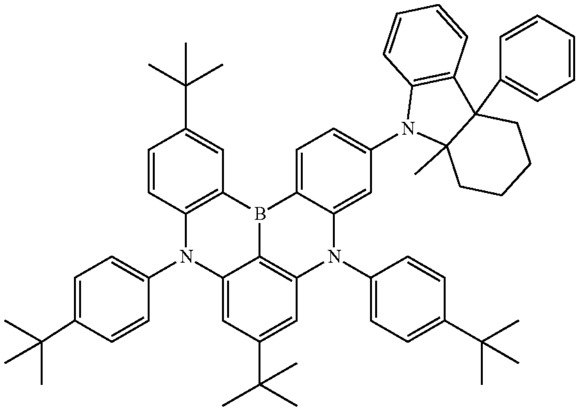
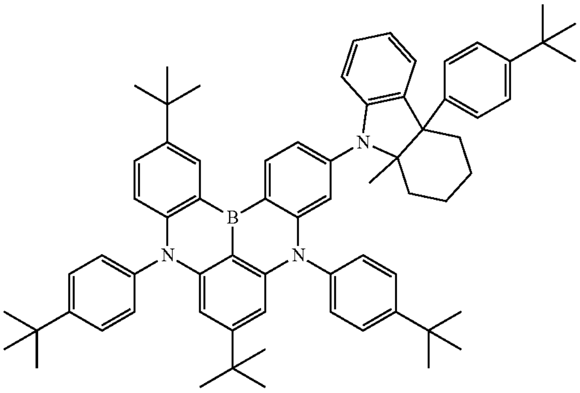
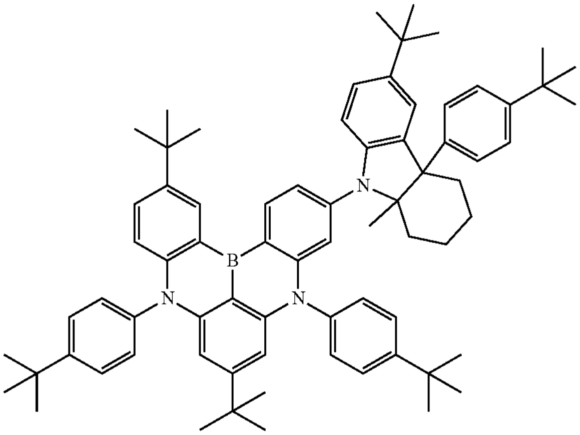
-continued
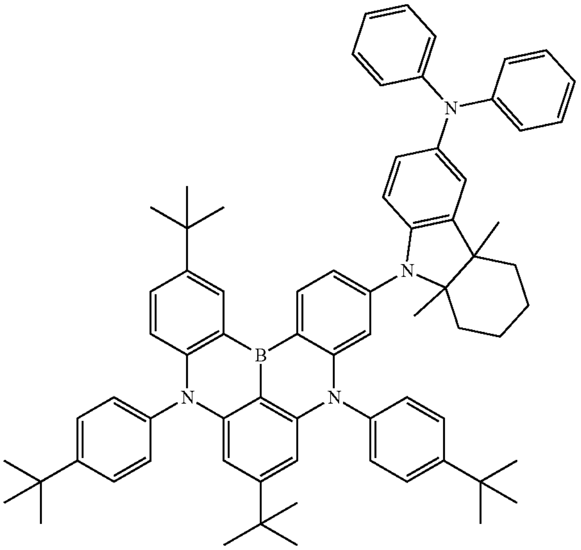
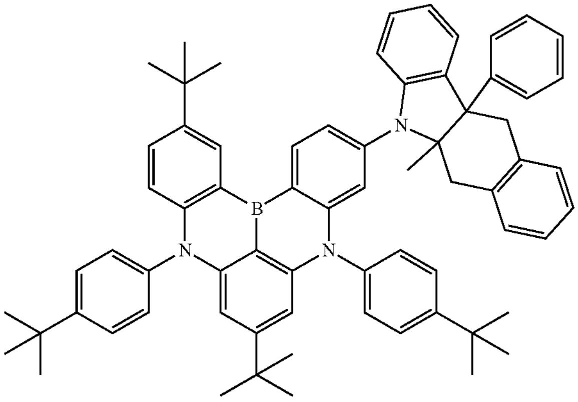
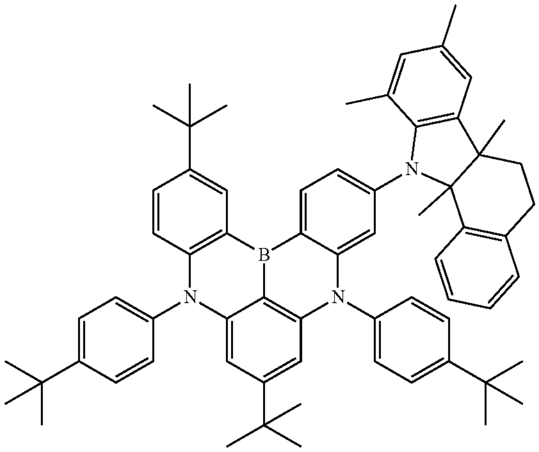

-continued
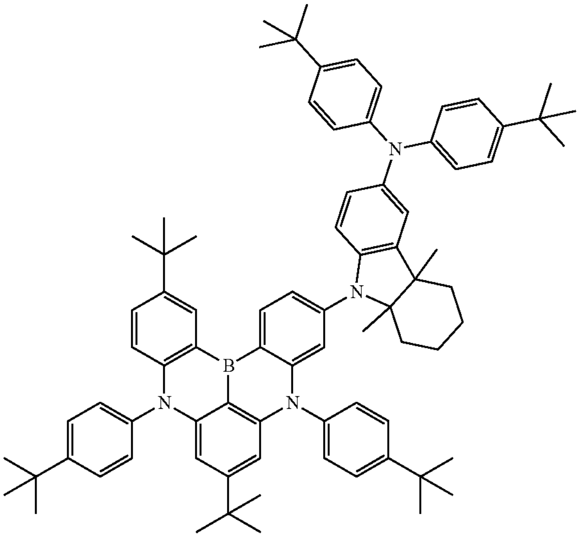
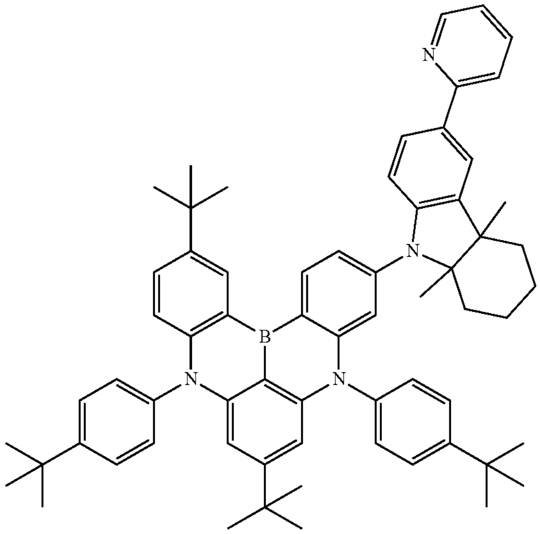
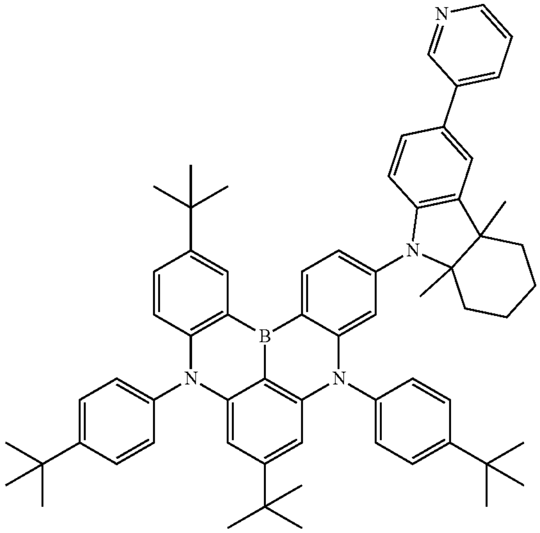
-continued
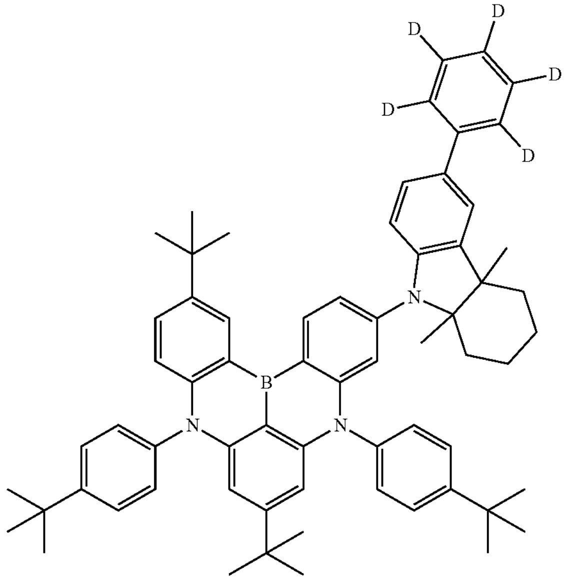
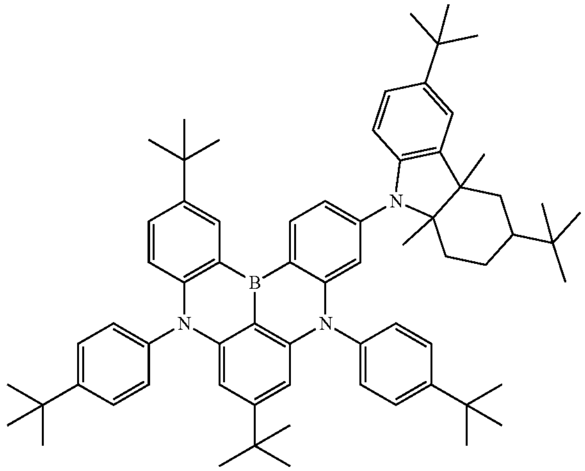
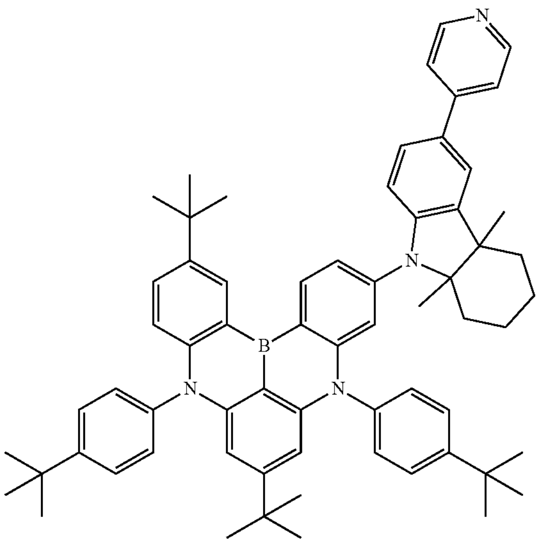

-continued
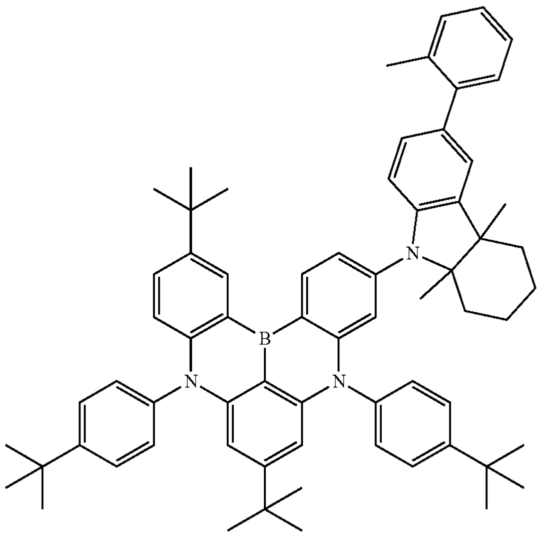
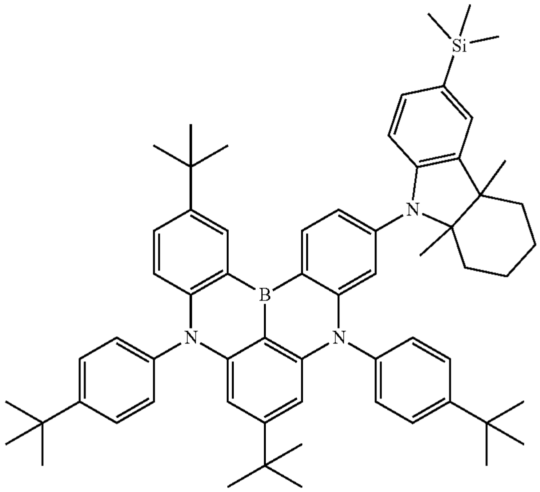
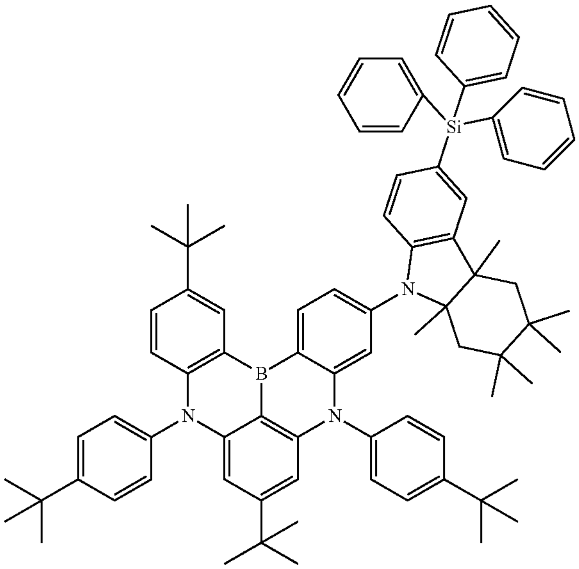
-continued
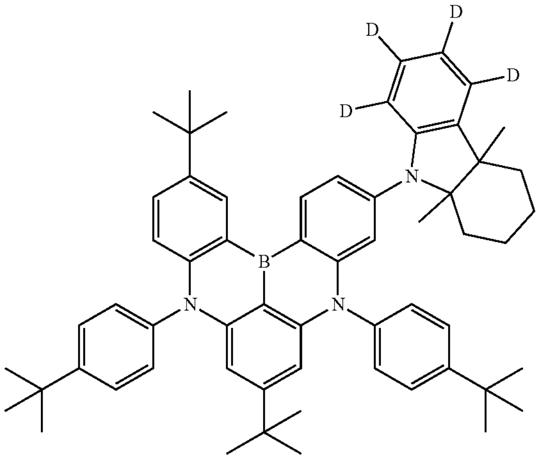
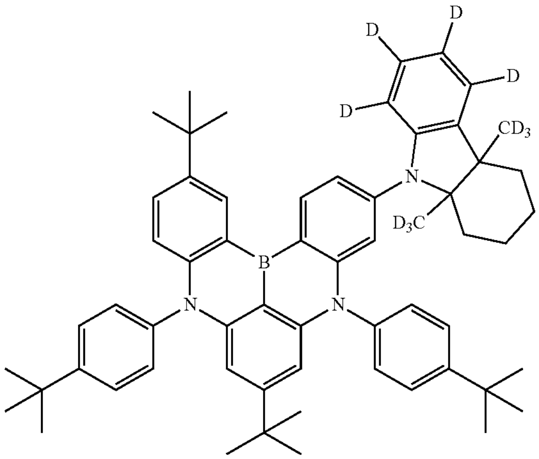
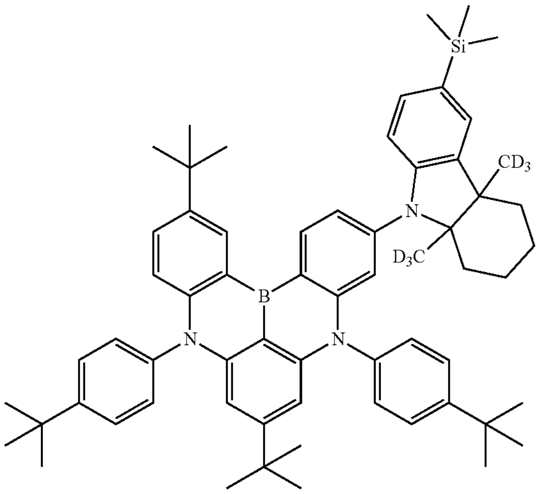

-continued
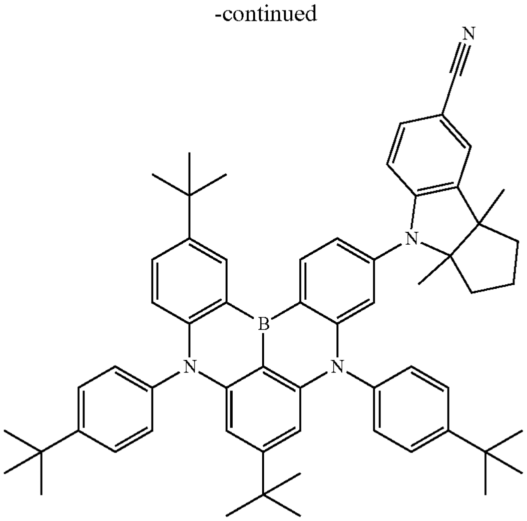
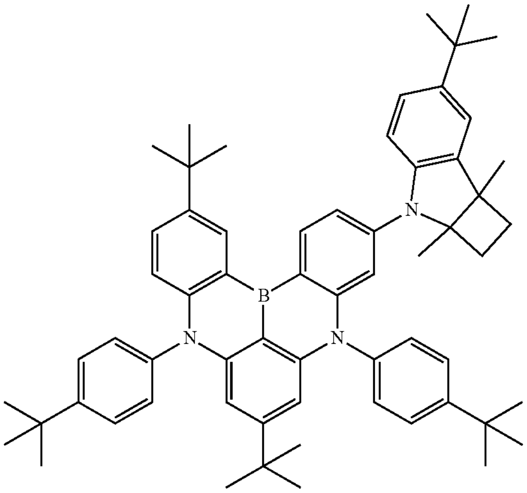
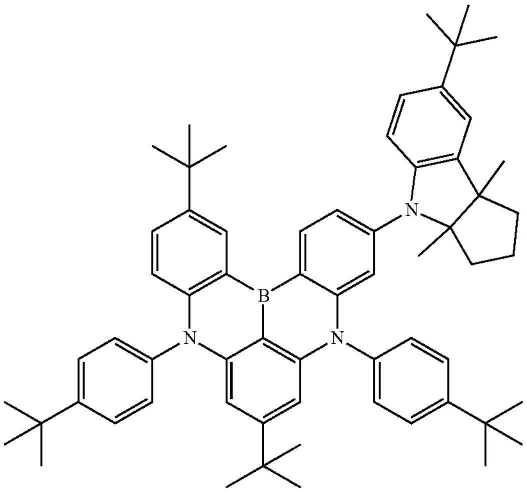
-continued
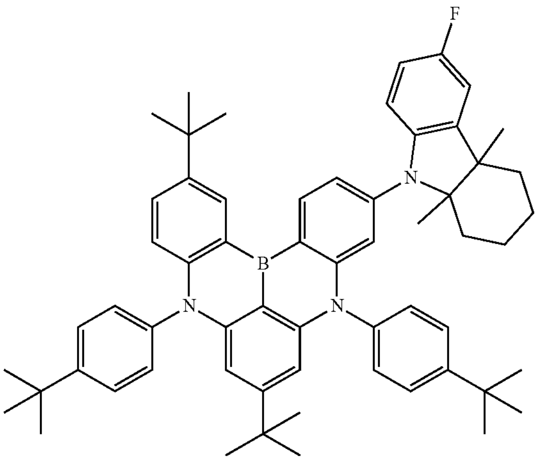
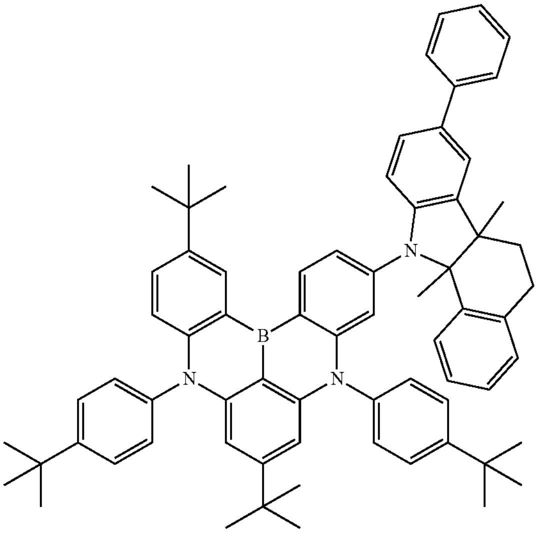
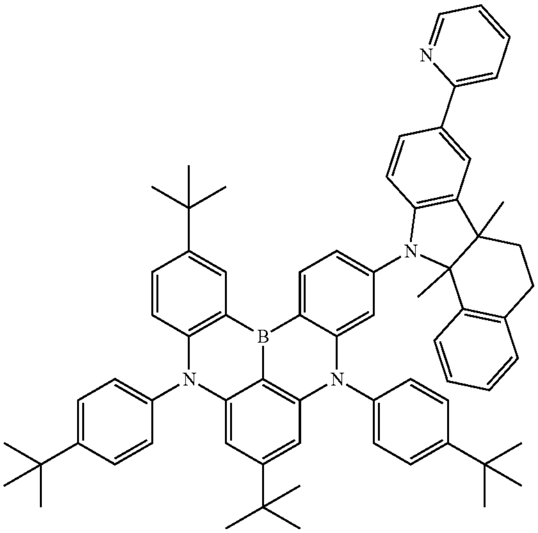

-continued
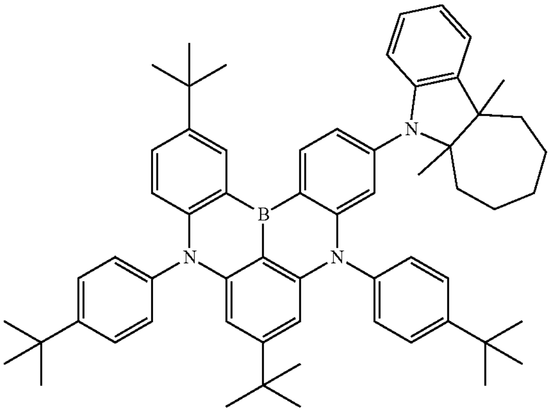
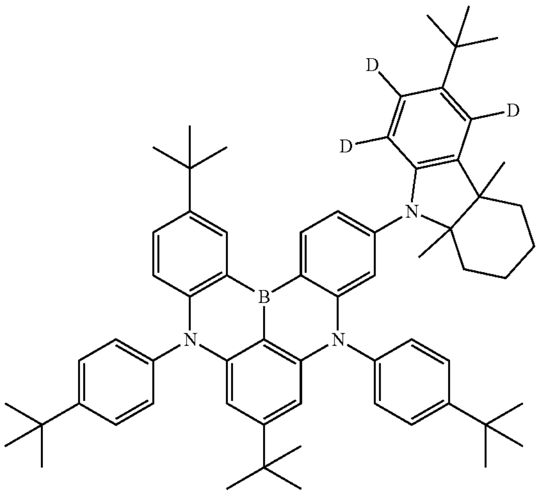
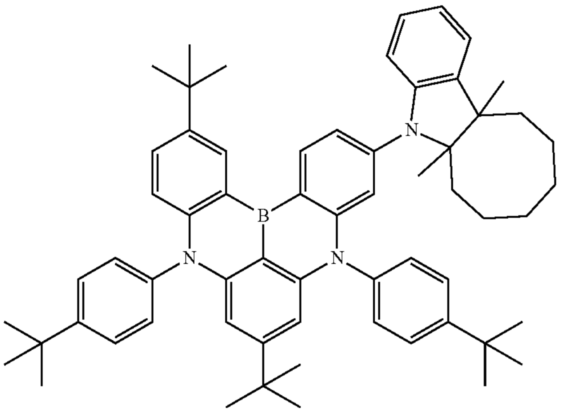
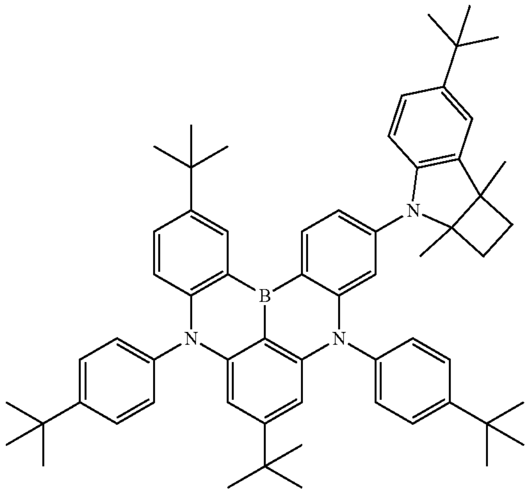
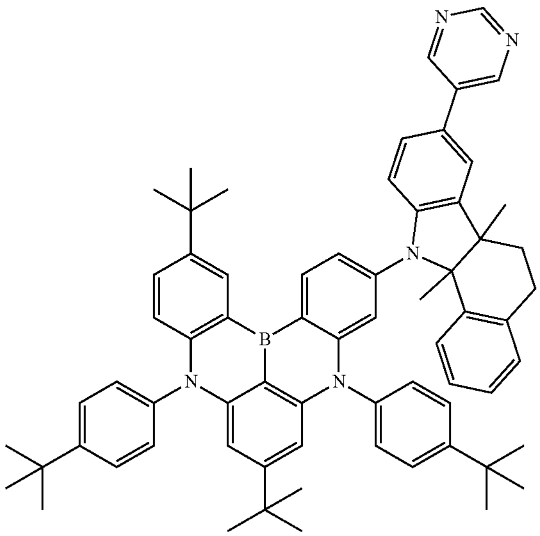
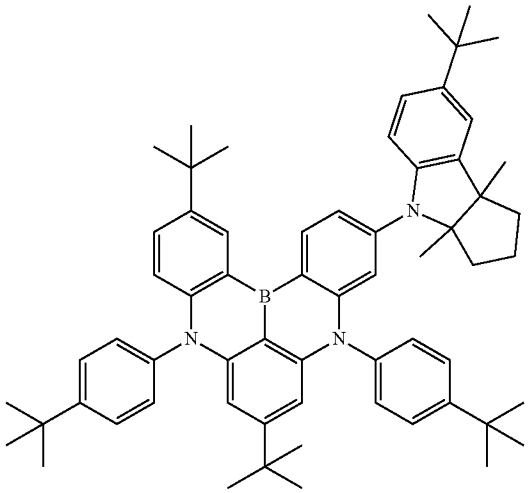
-continued -continued
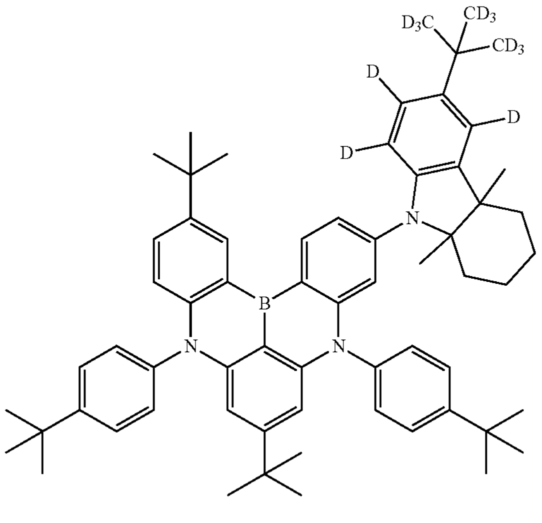
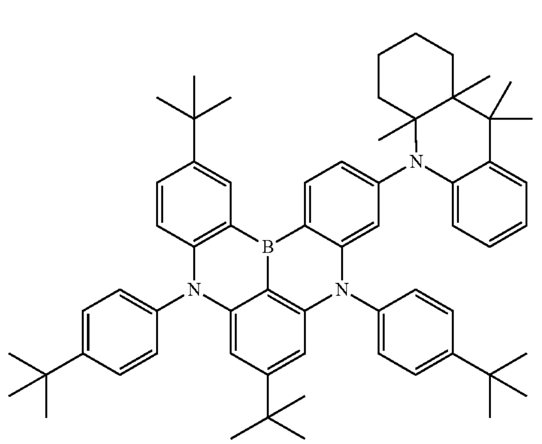
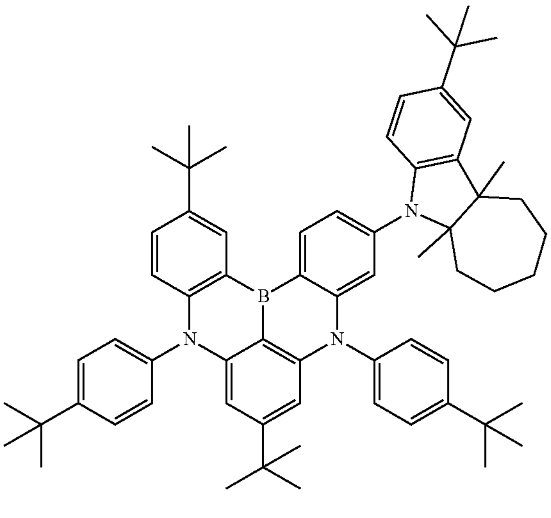
-continued
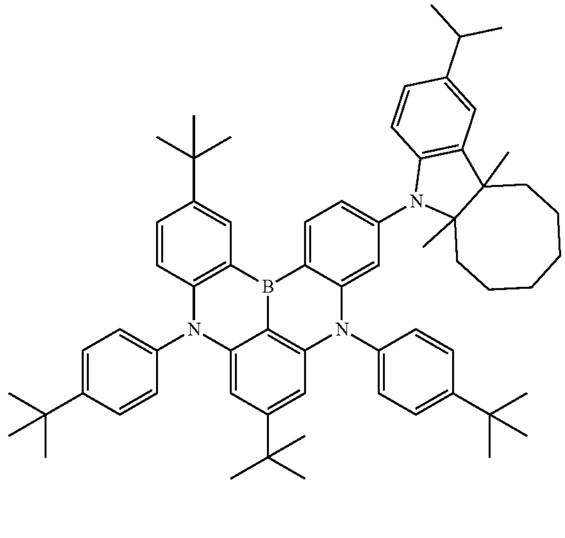
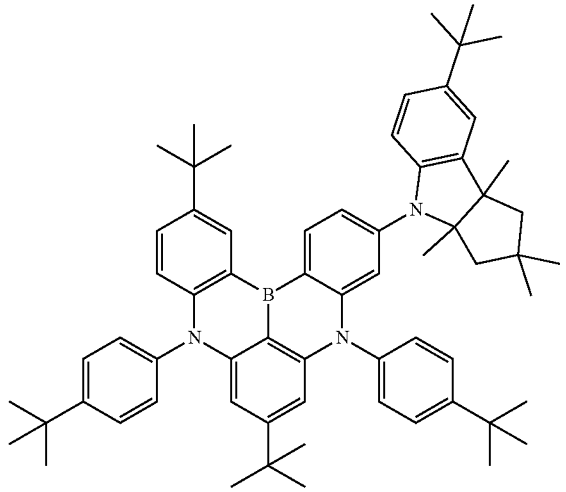
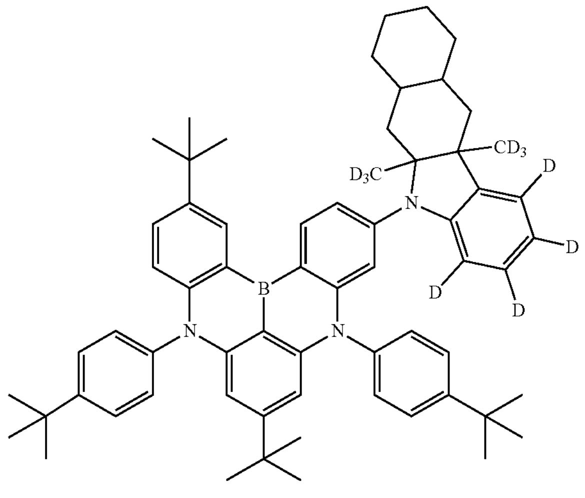

-continued
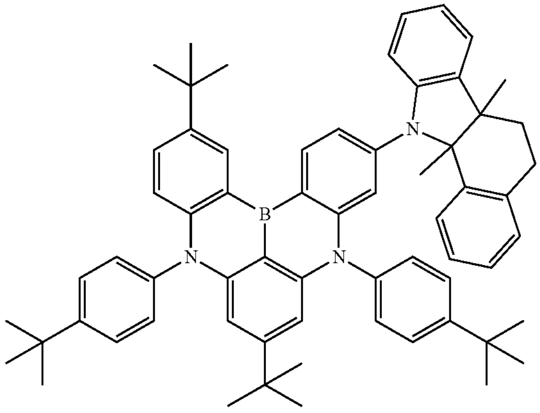
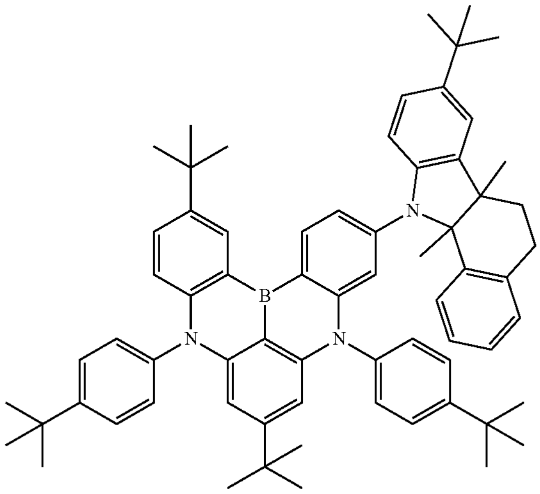
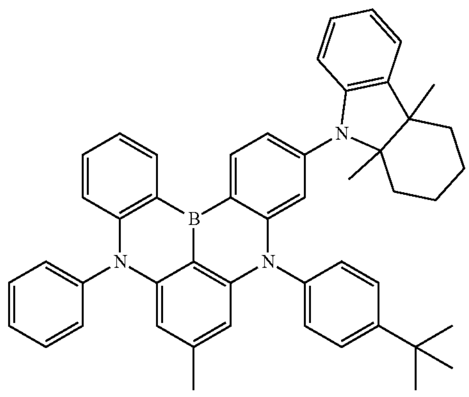
-continued
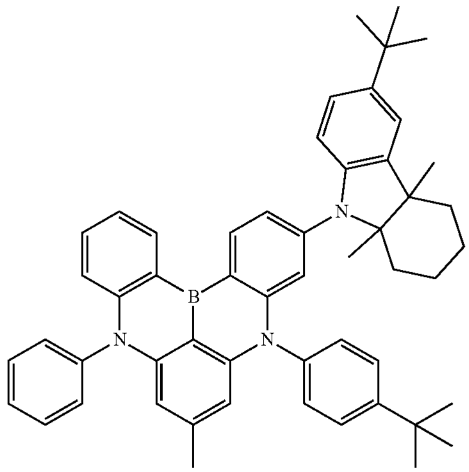
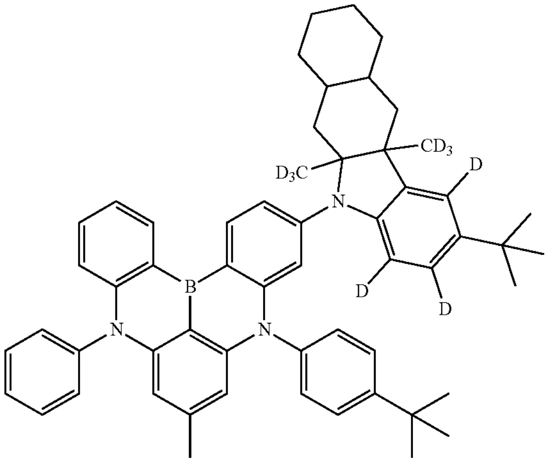
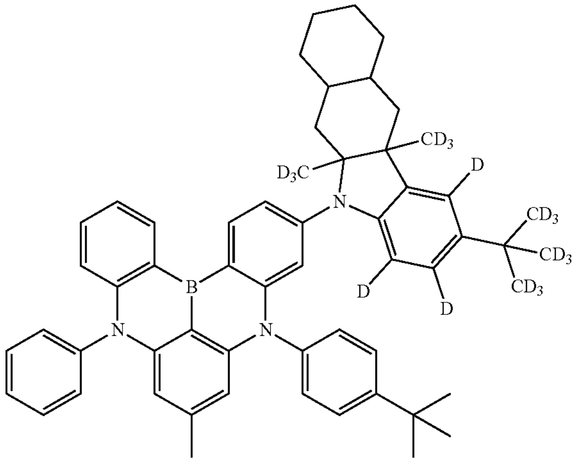

-continued
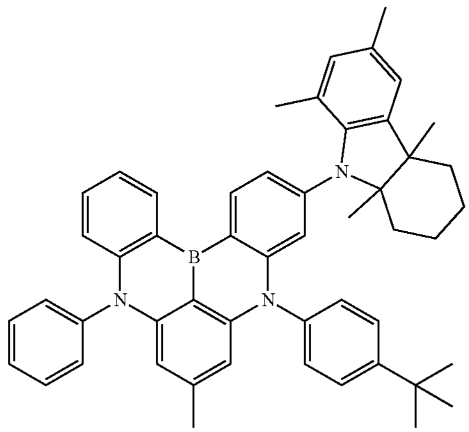
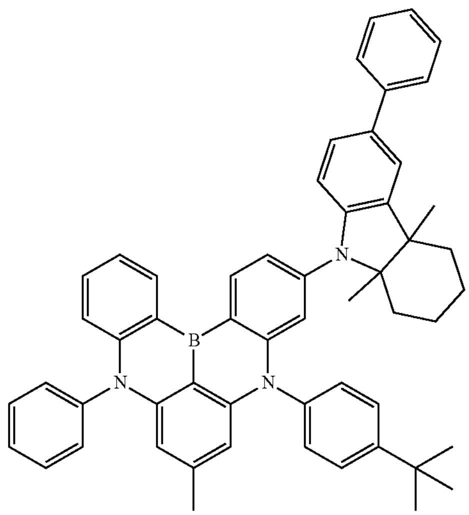
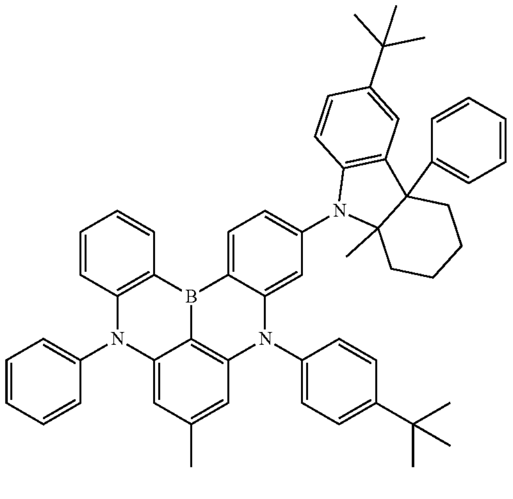
-continued
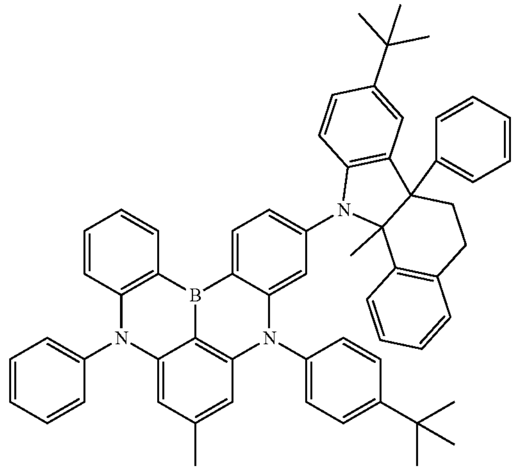
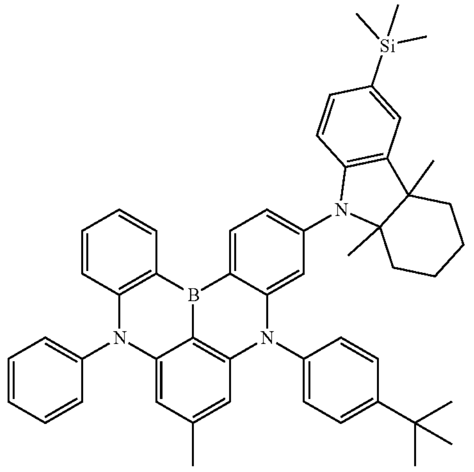
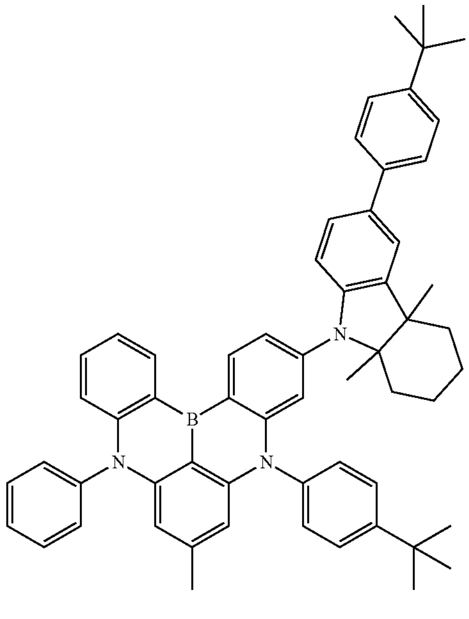

-continued
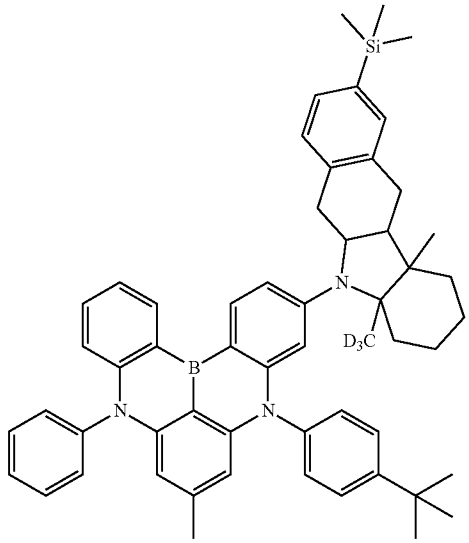
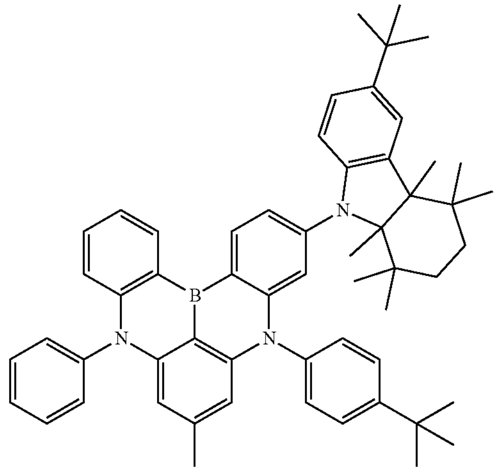
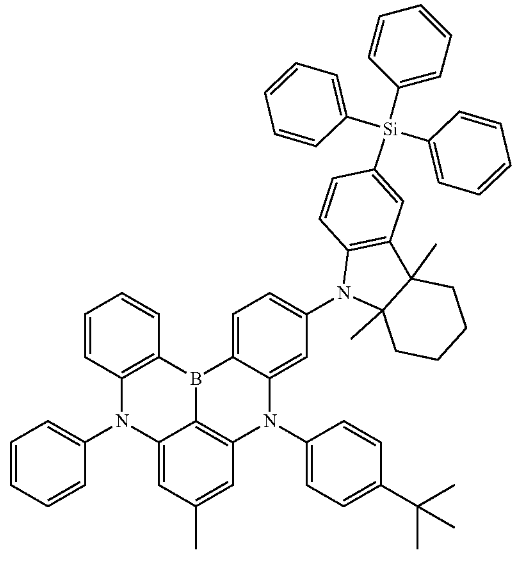
-continued
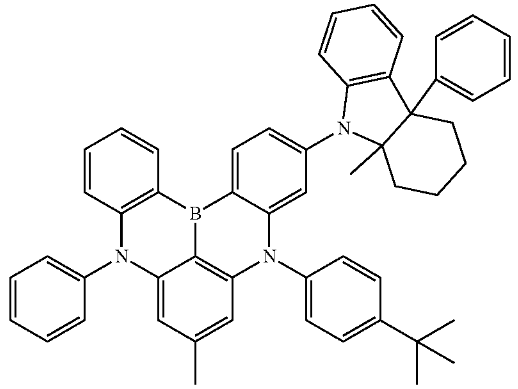
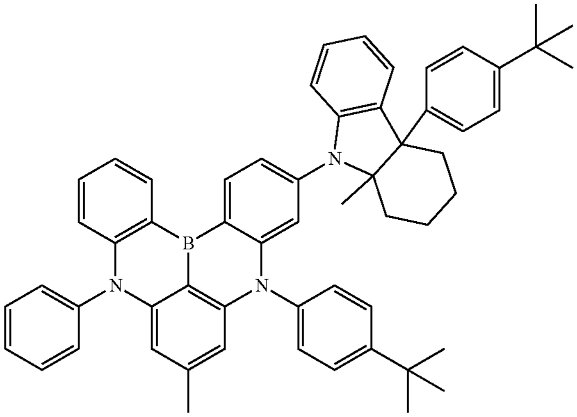
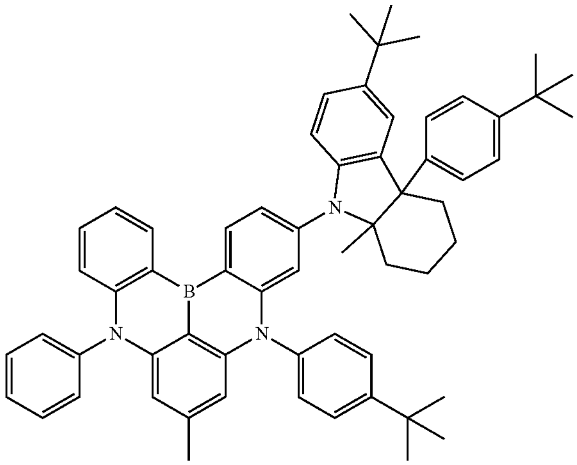

-continued
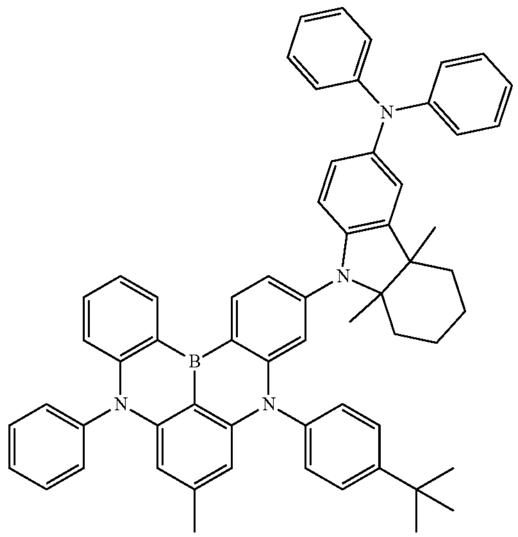
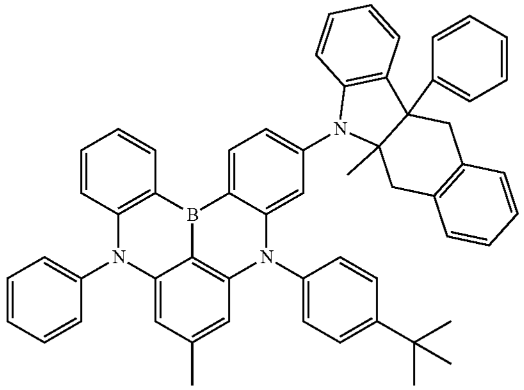
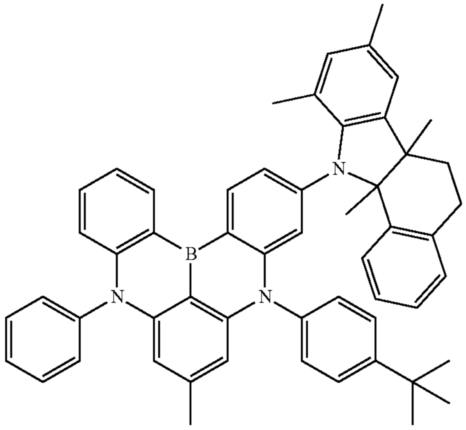
-continued
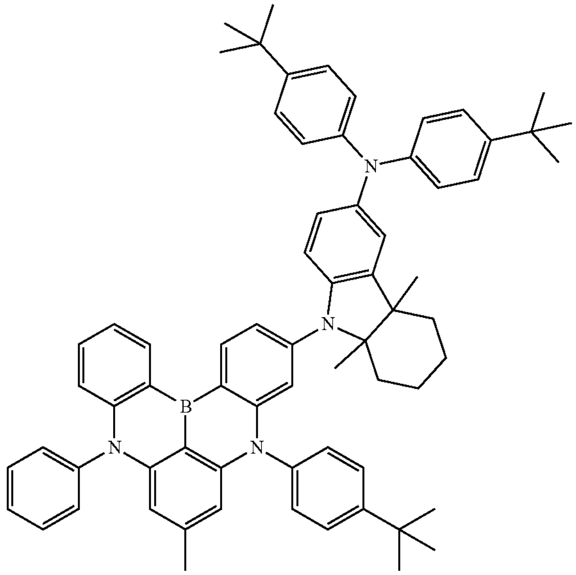
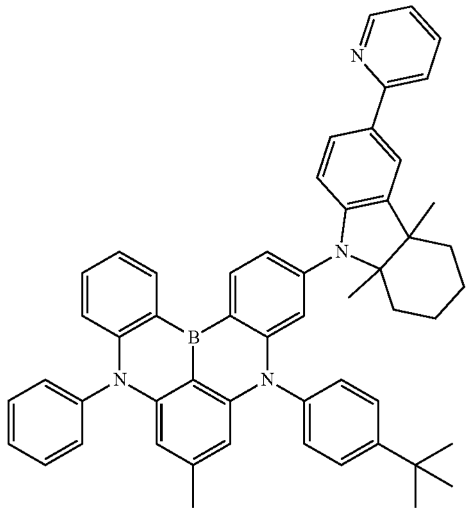
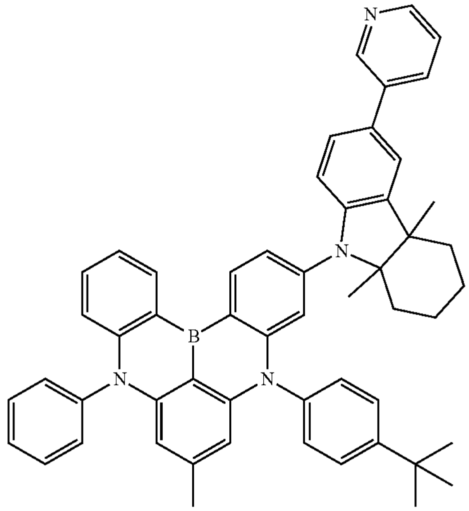

-continued
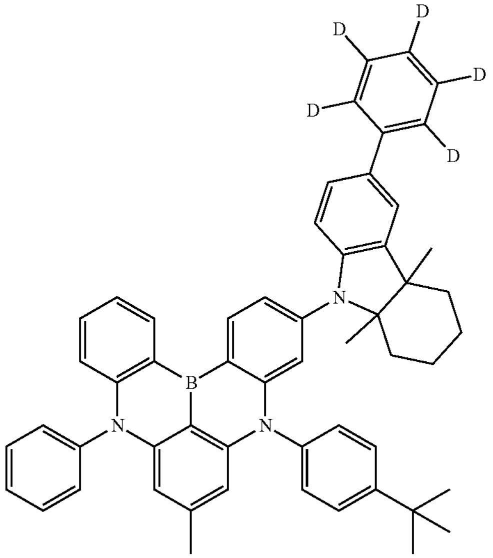
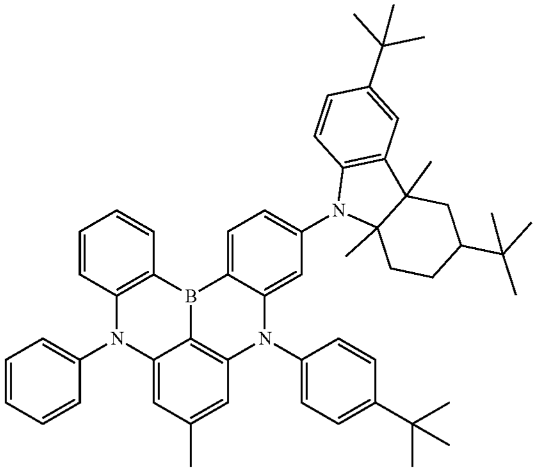
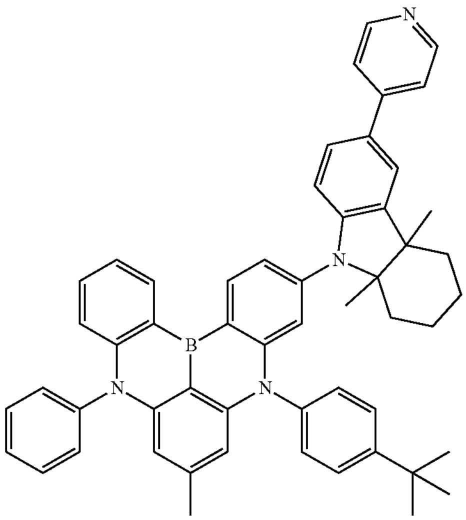
-continued
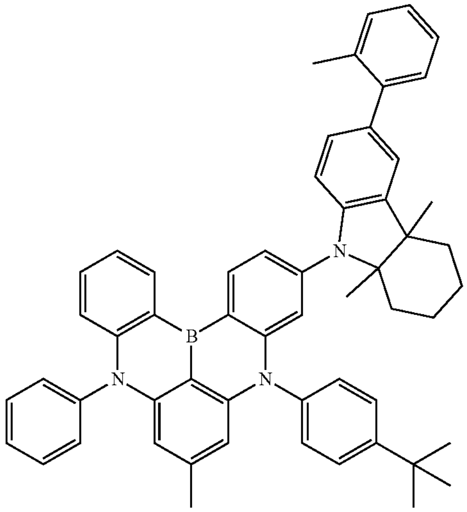
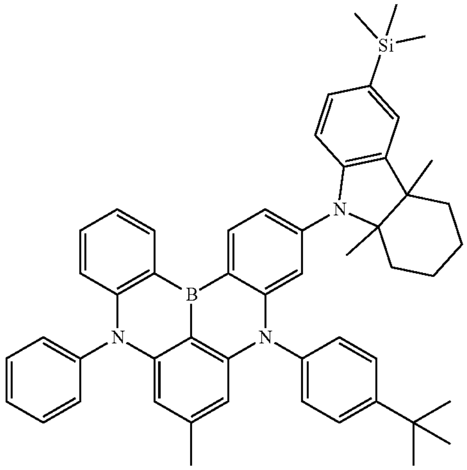
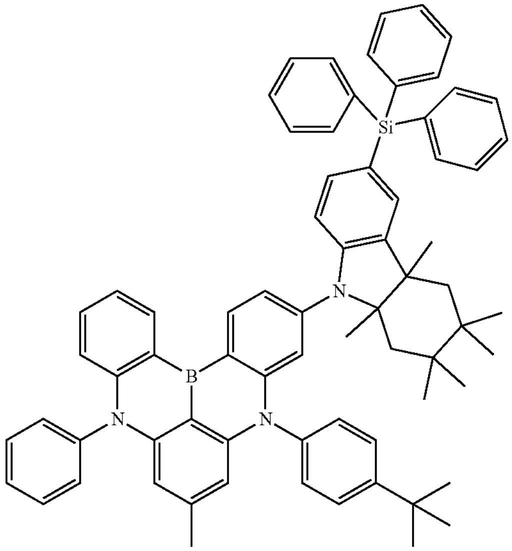

-continued
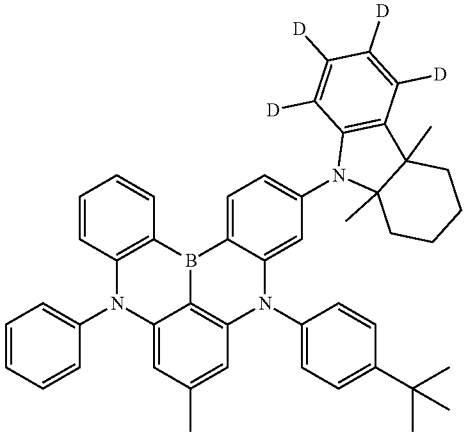
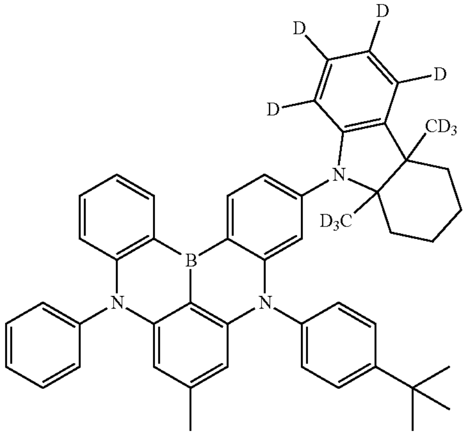
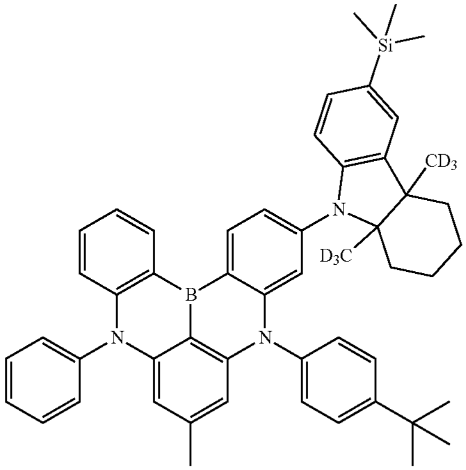
-continued
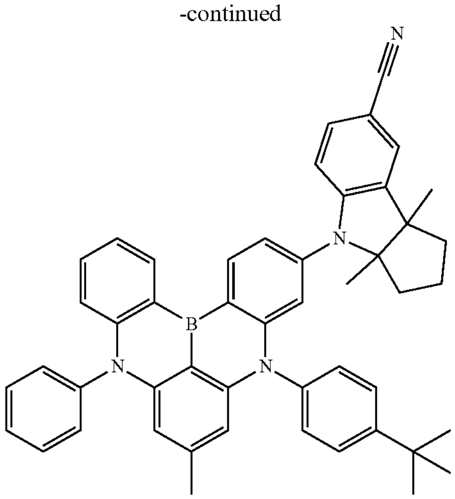
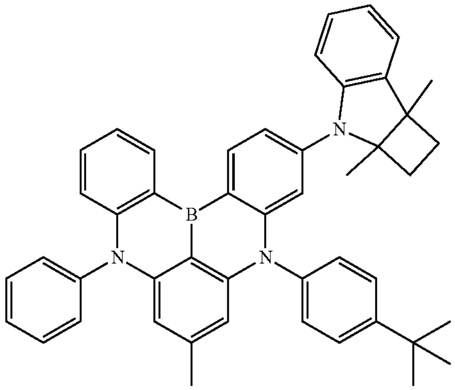
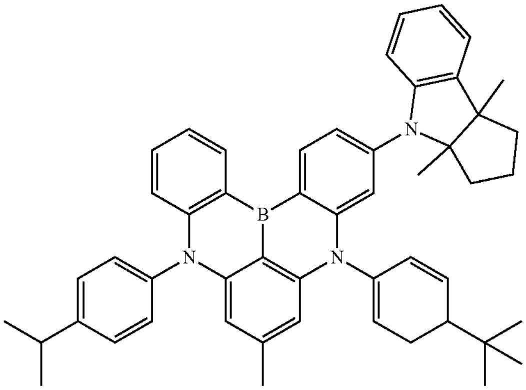
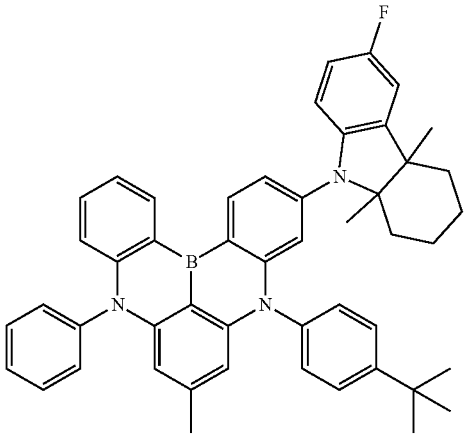

-continued
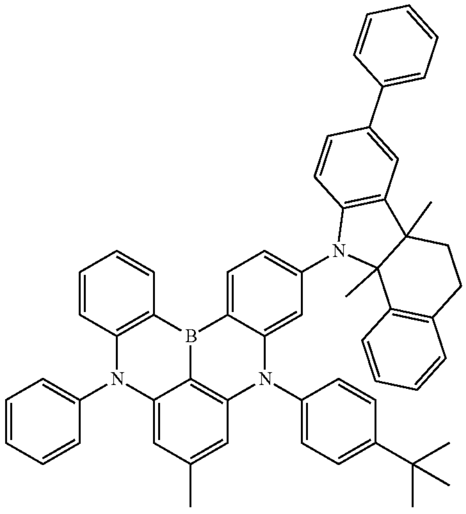
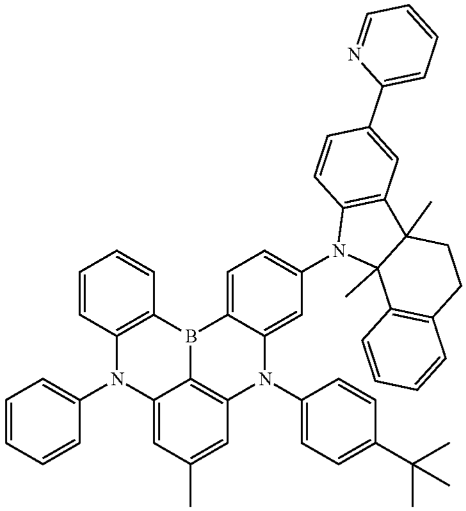
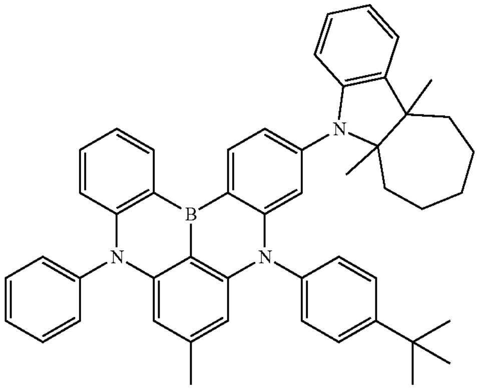
-continued
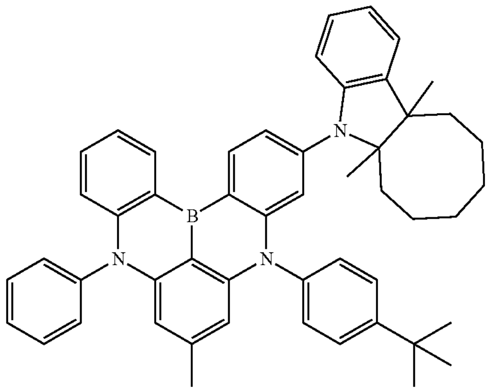
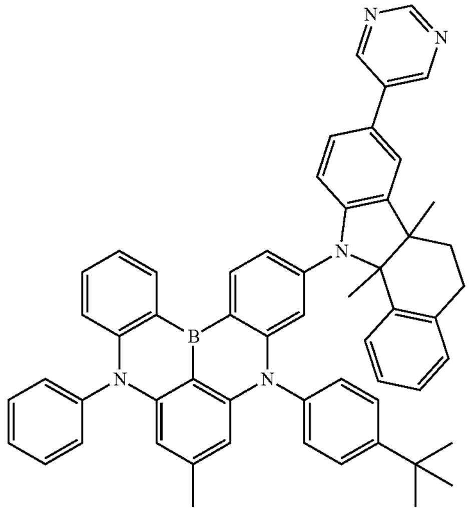
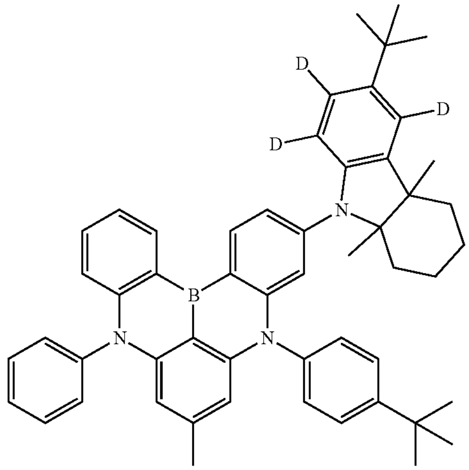

-continued
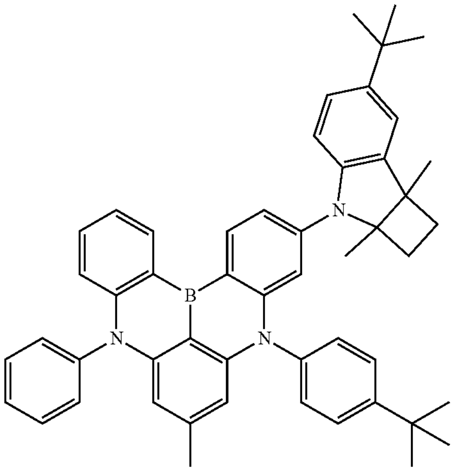
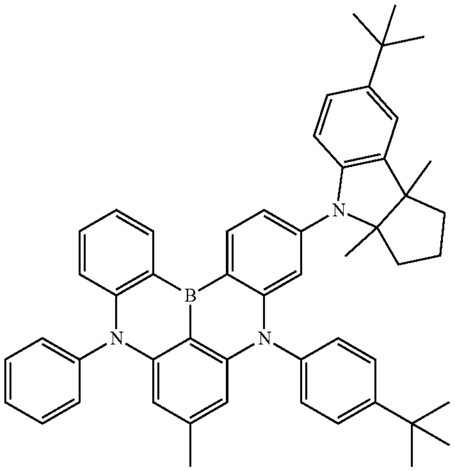
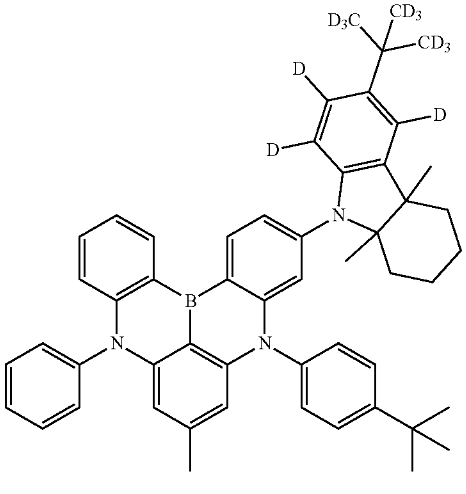
-continued
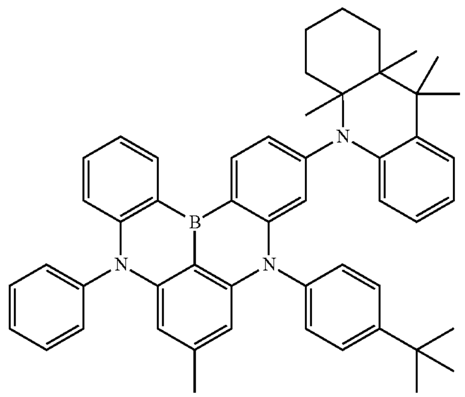
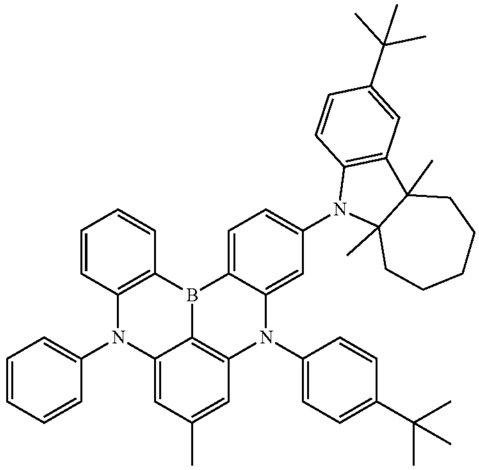
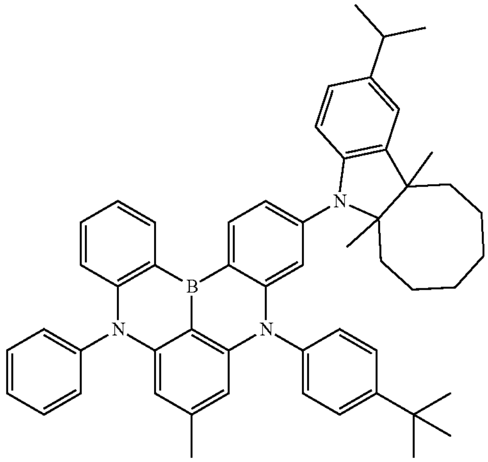

-continued
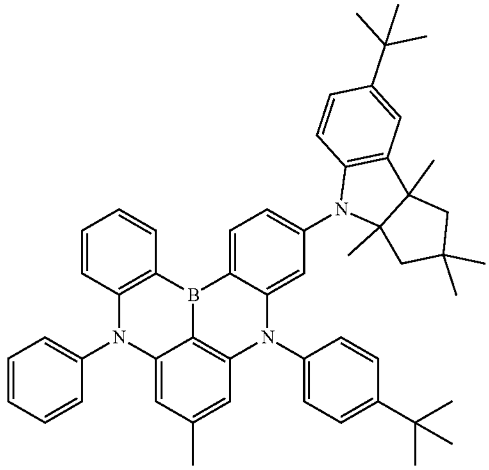
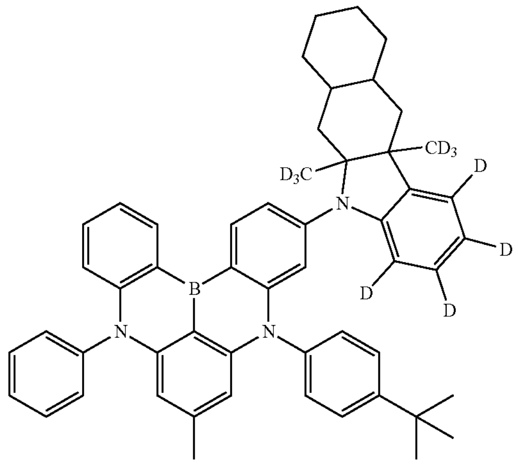
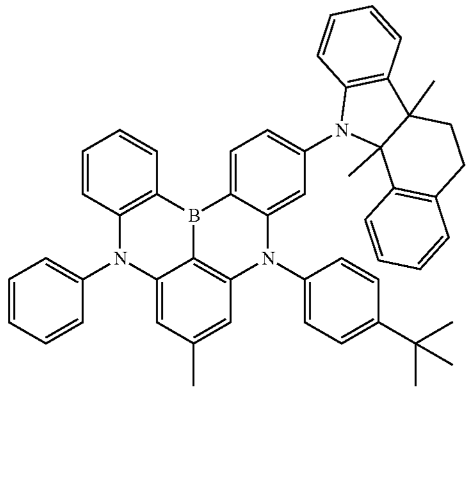
-continued
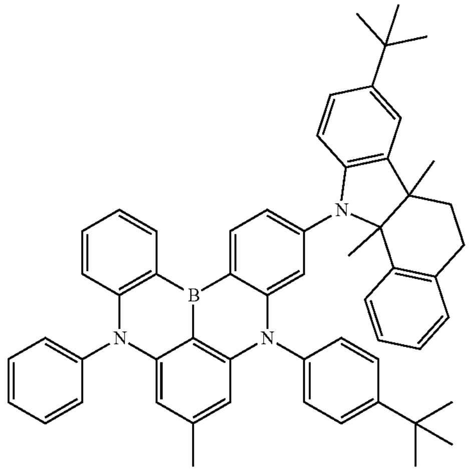
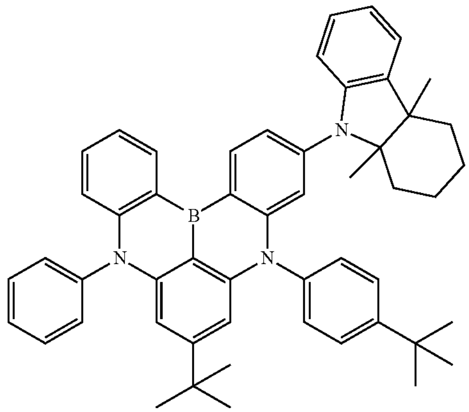
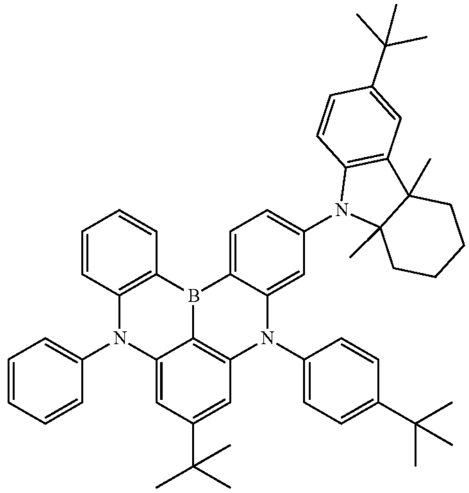

-continued
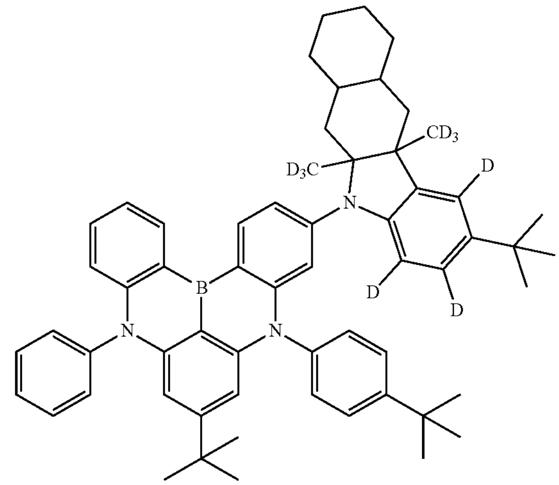
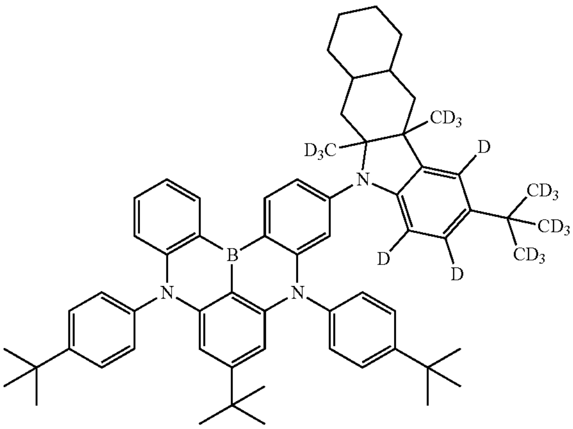
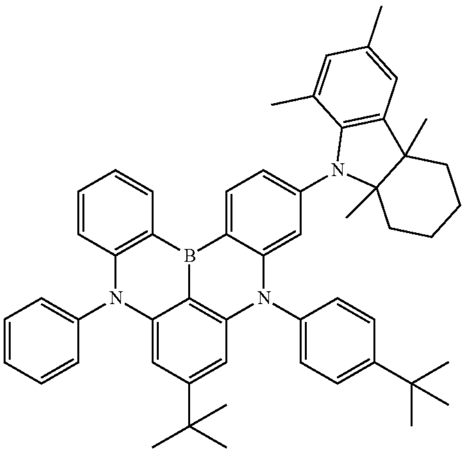
-continued
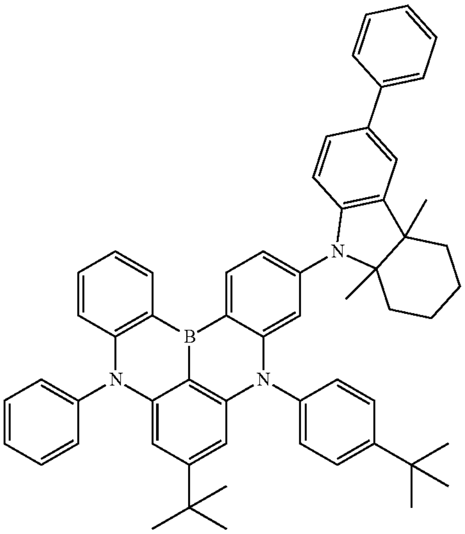
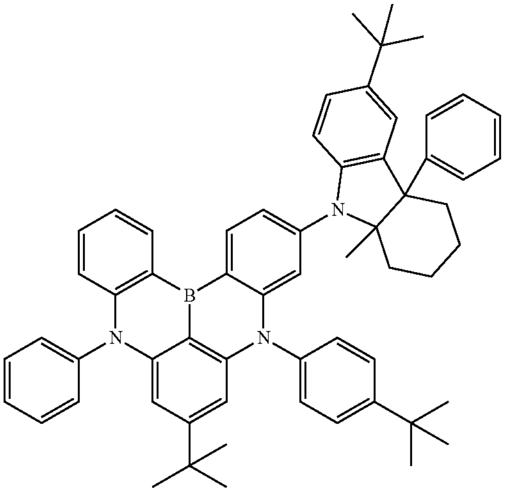
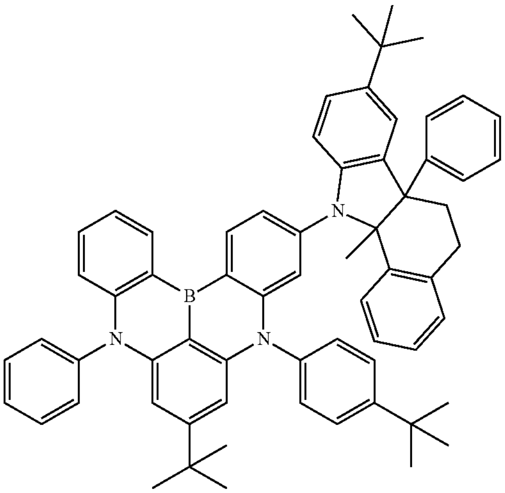

-continued
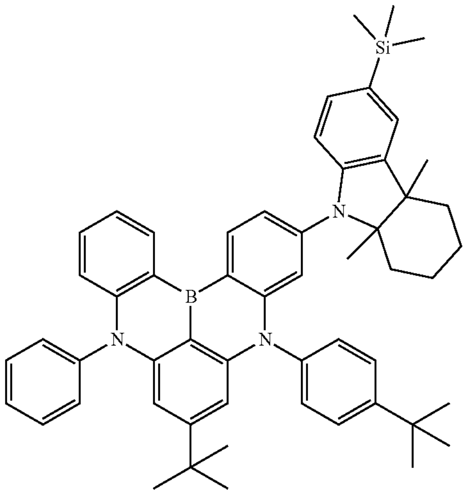
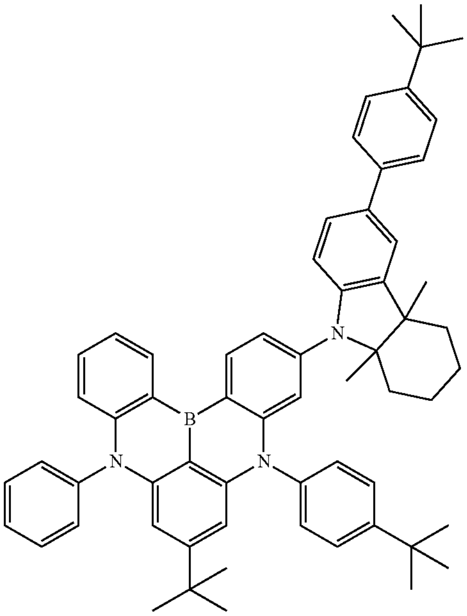
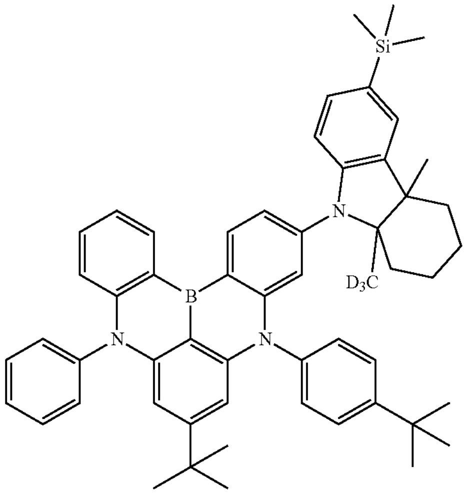
-continued
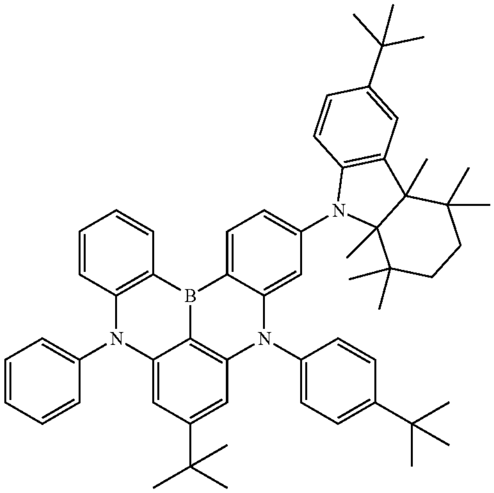
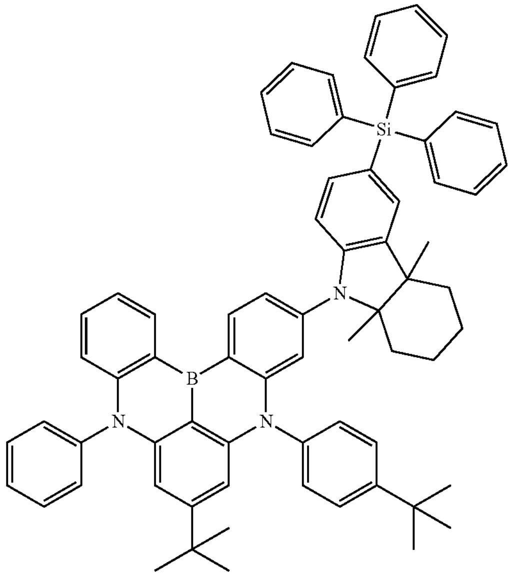
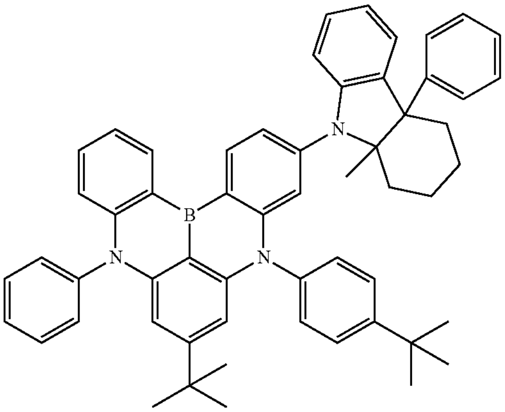

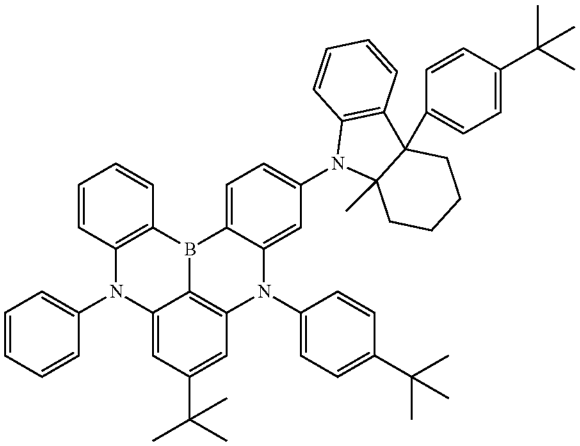
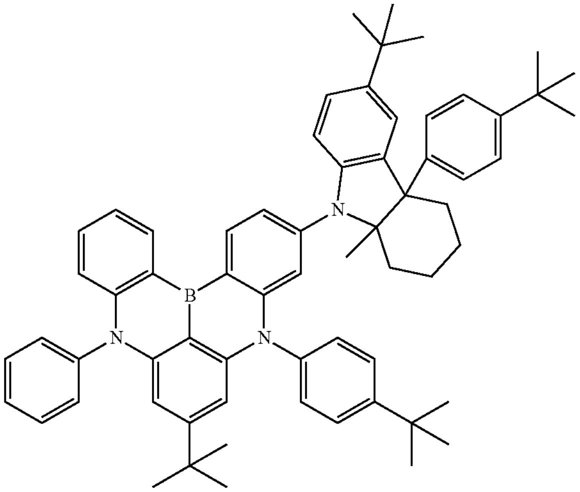
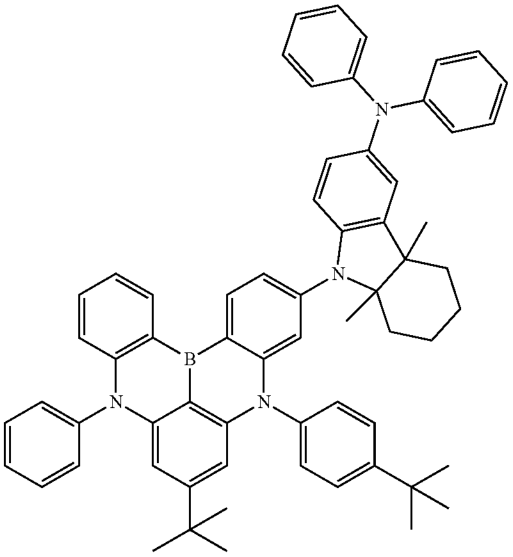
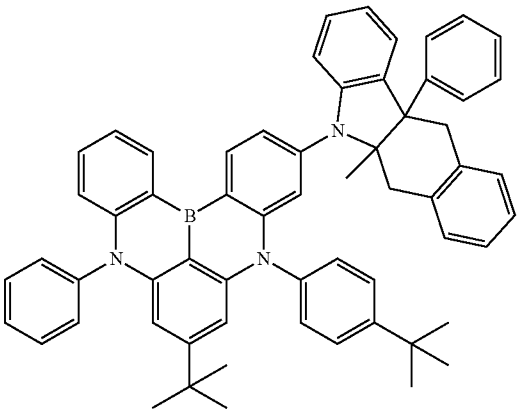
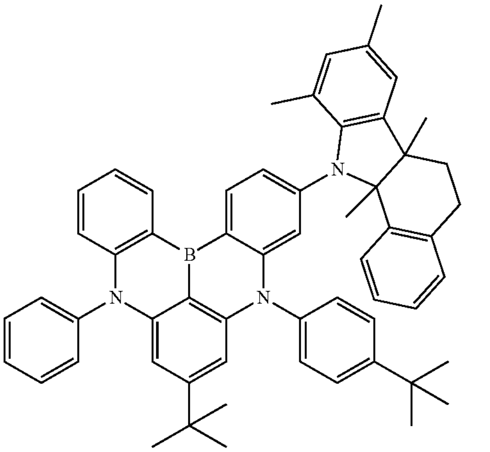
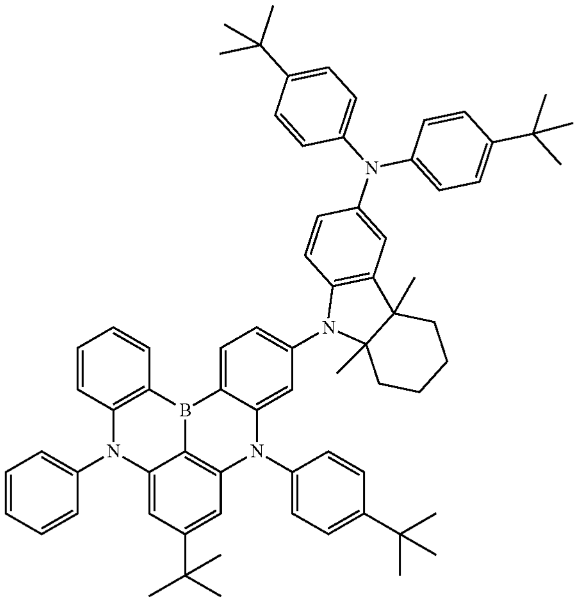

-continued
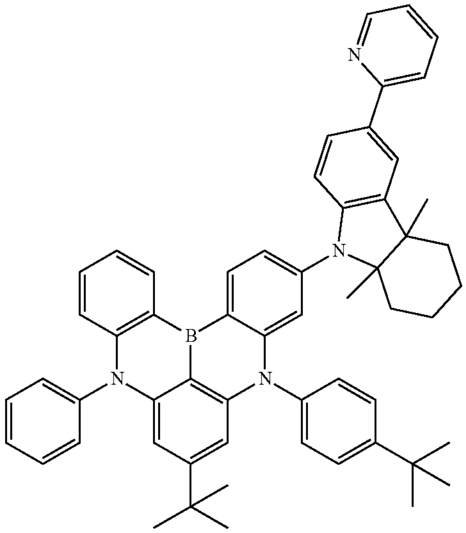
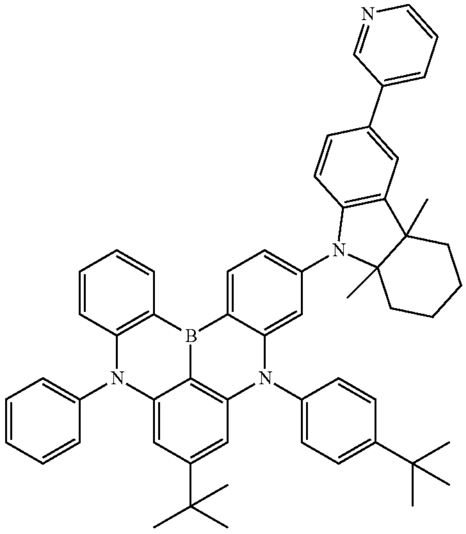
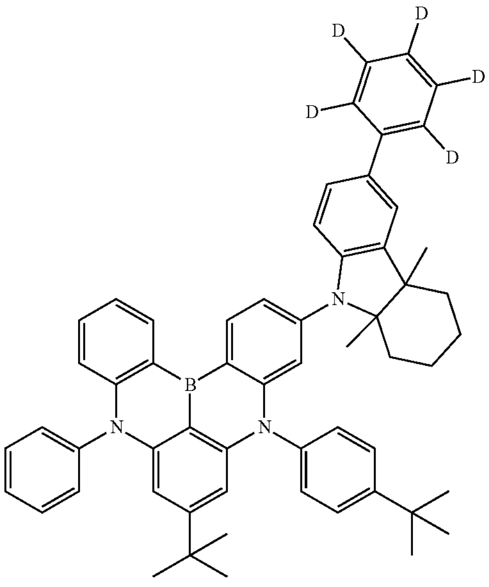
-continued
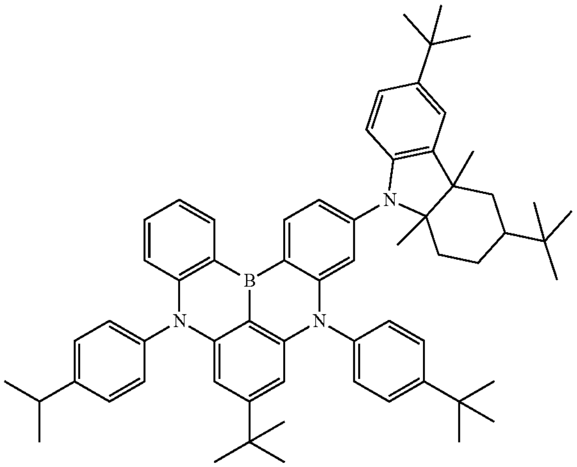
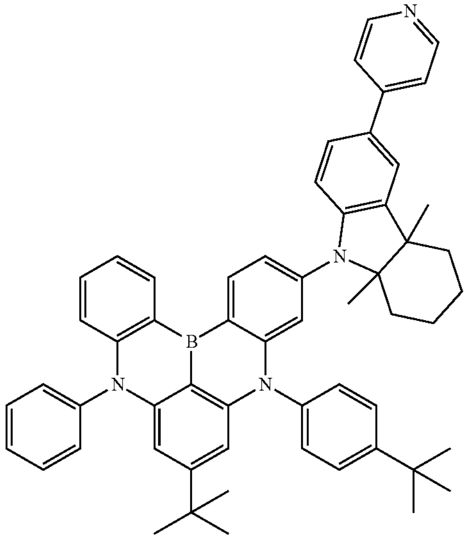
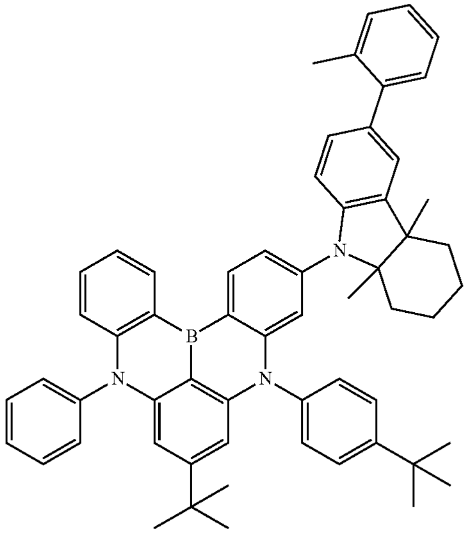

-continued
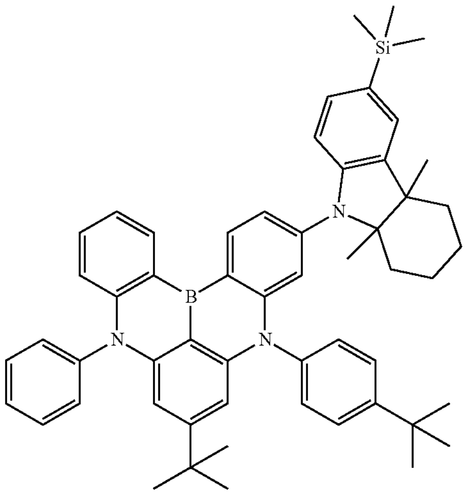
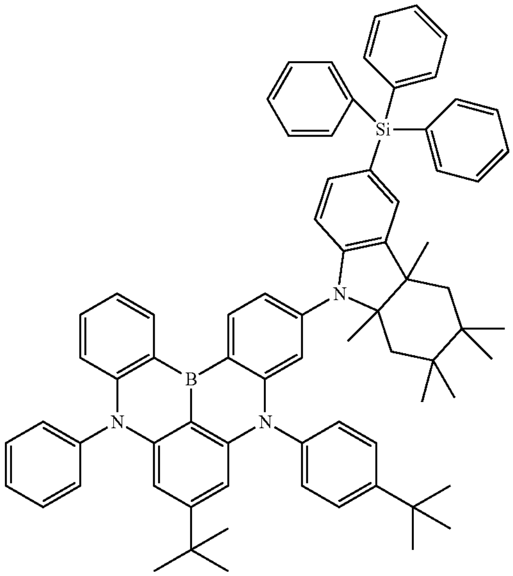
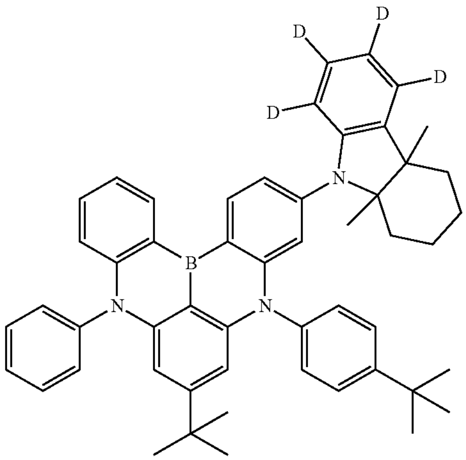
-continued
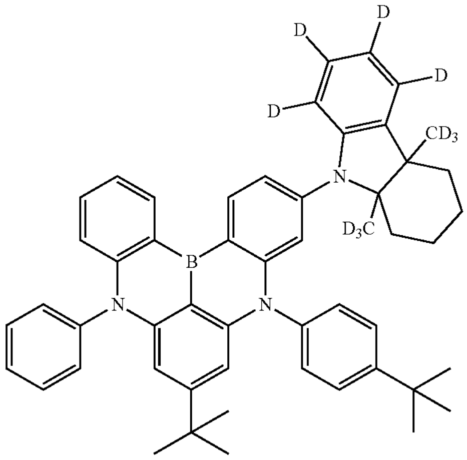
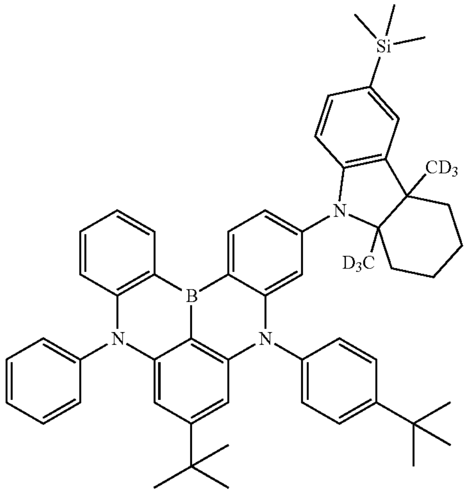
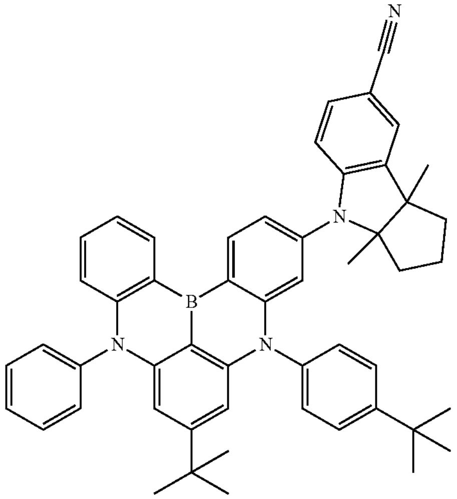

-continued
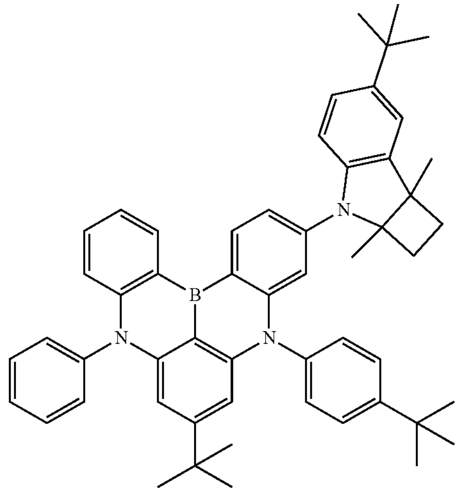
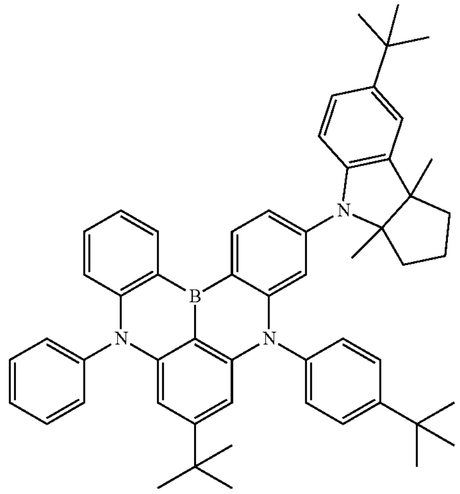
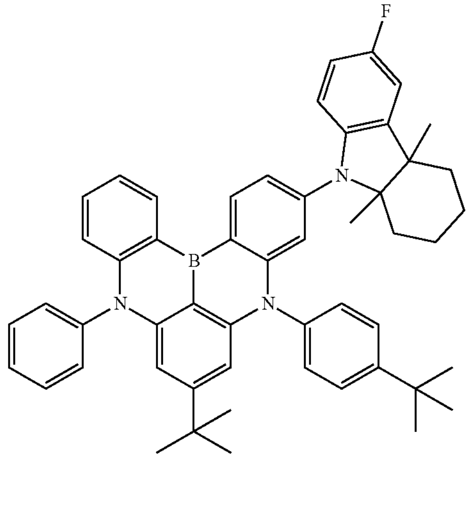
-continued
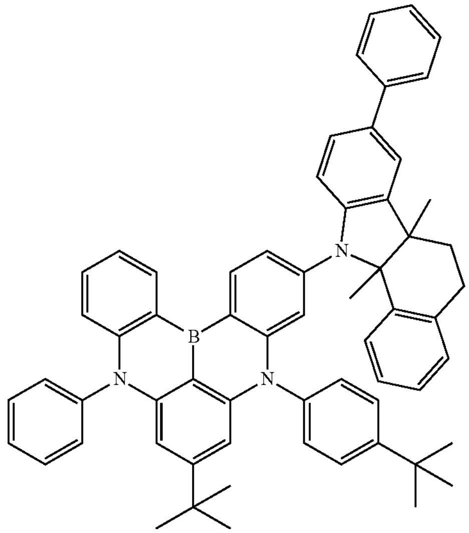
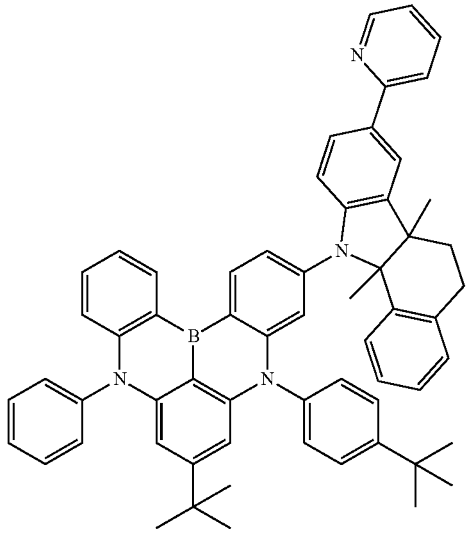
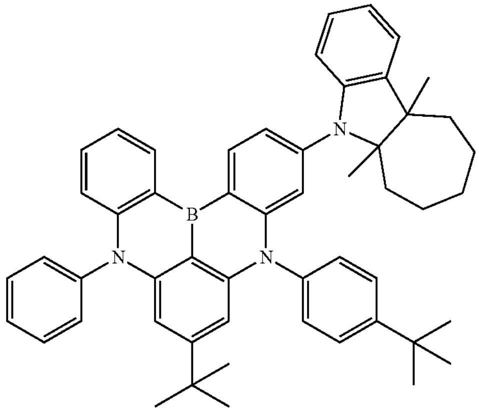

-continued
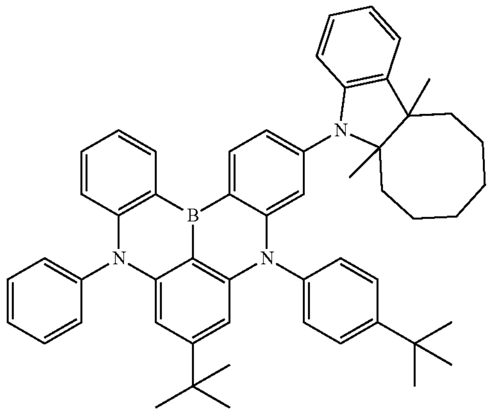
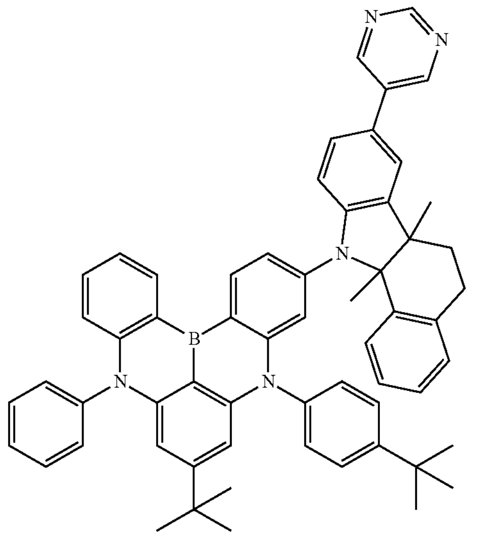
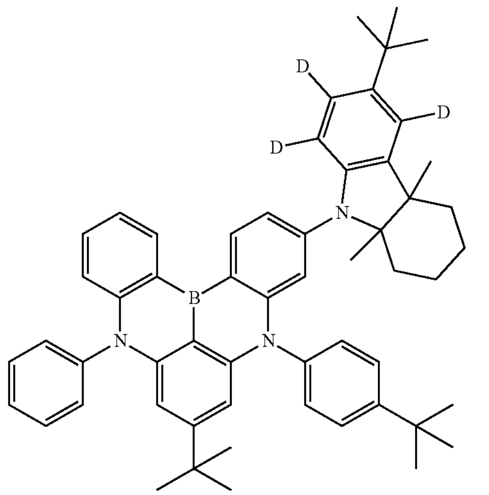
-continued
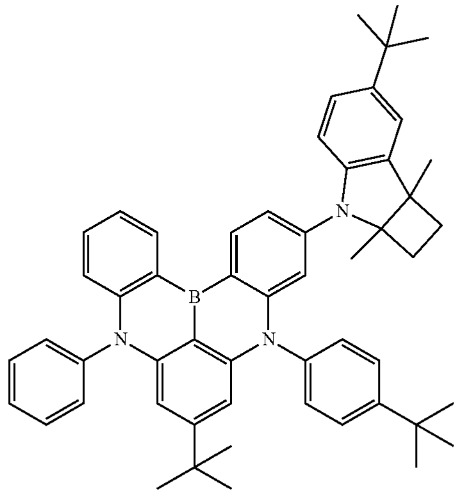
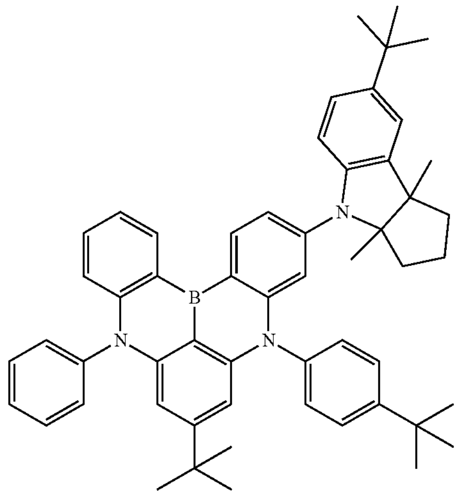
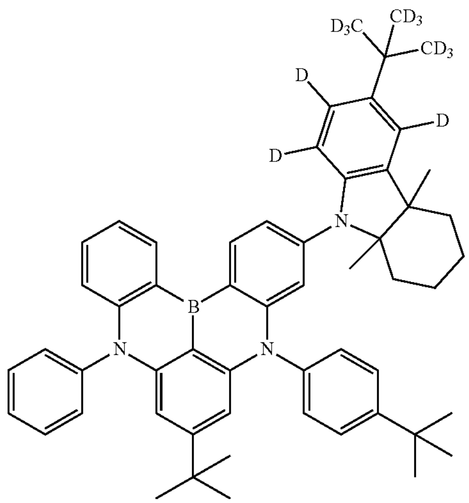

-continued
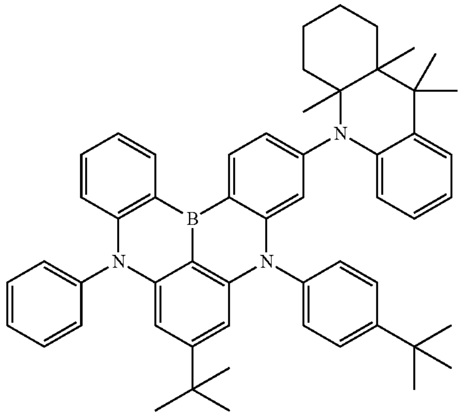
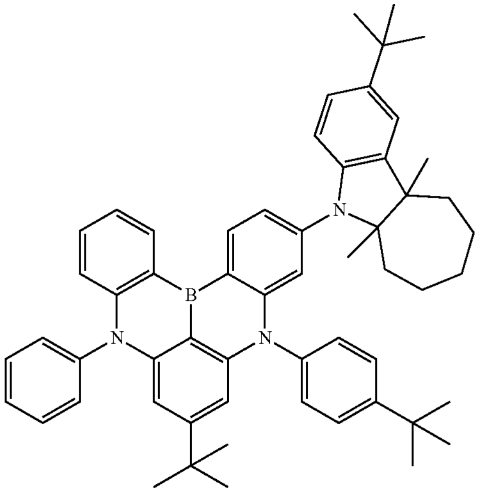
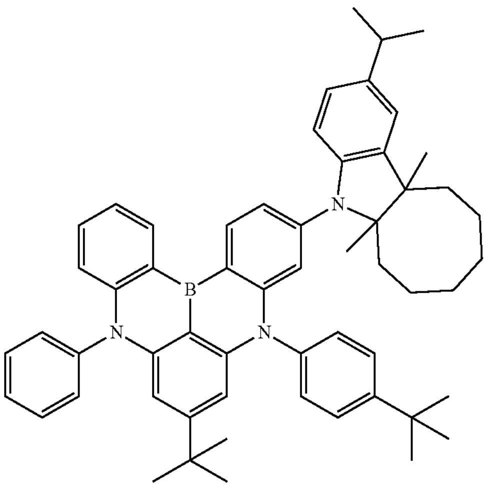
-continued
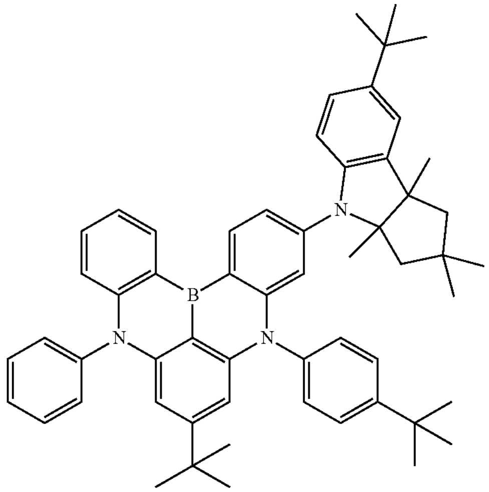
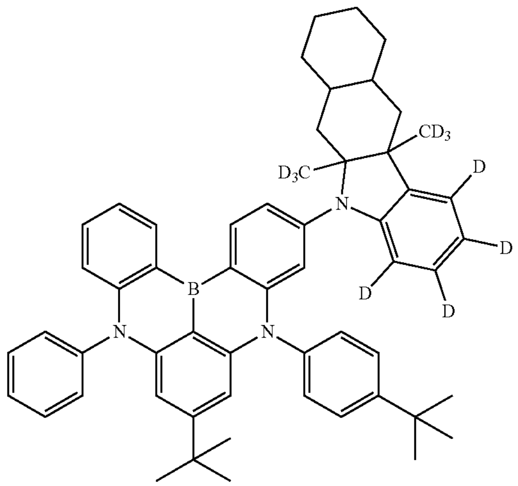
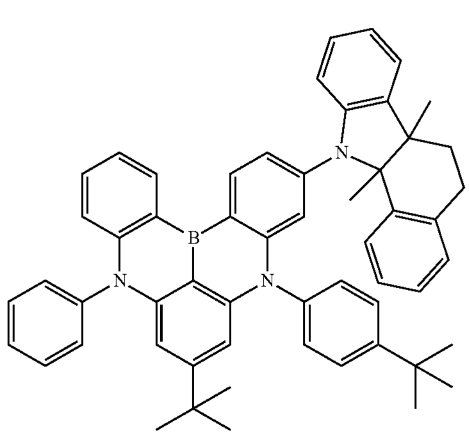

-continued
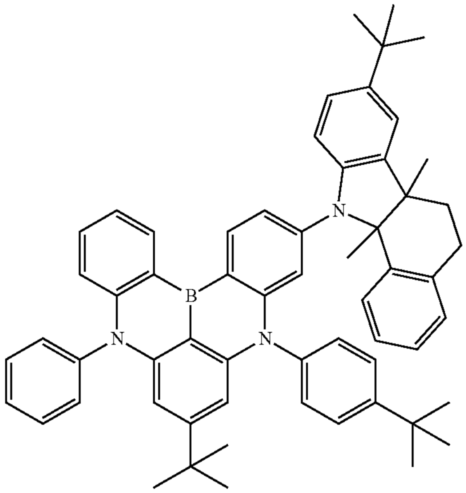
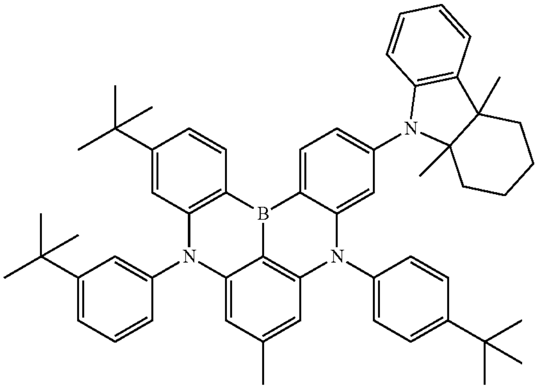
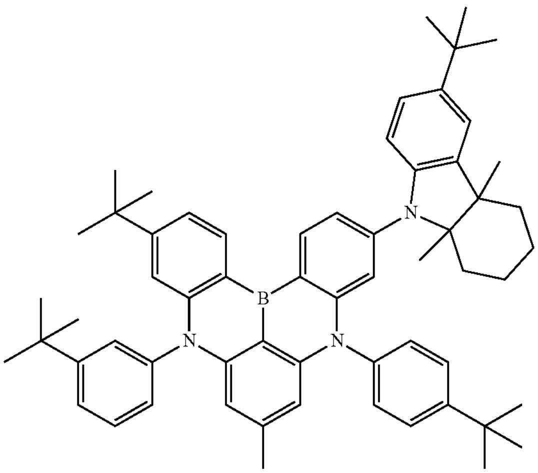
-continued
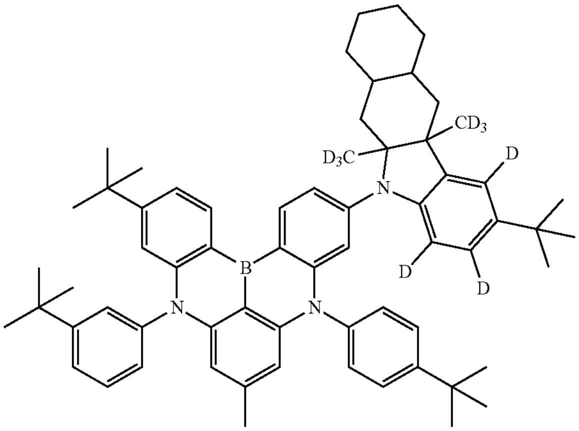
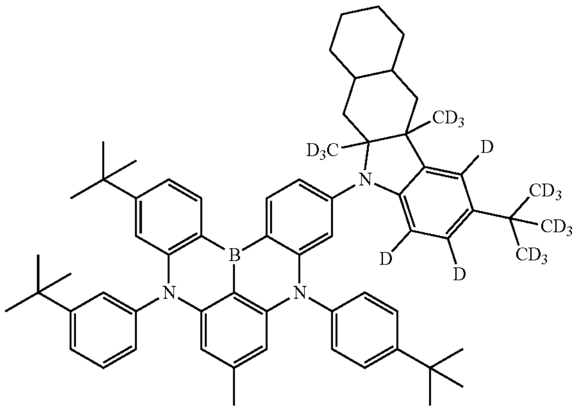
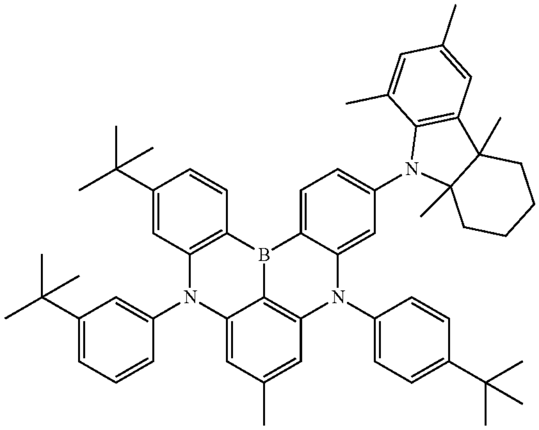

-continued
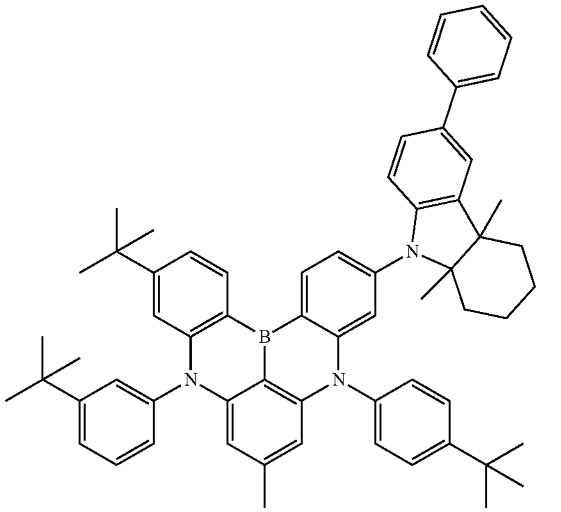
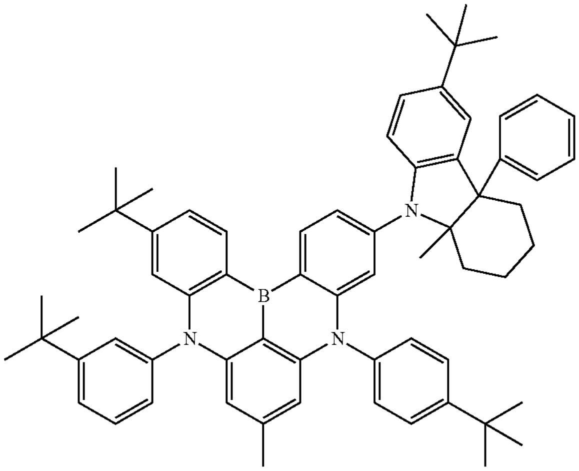
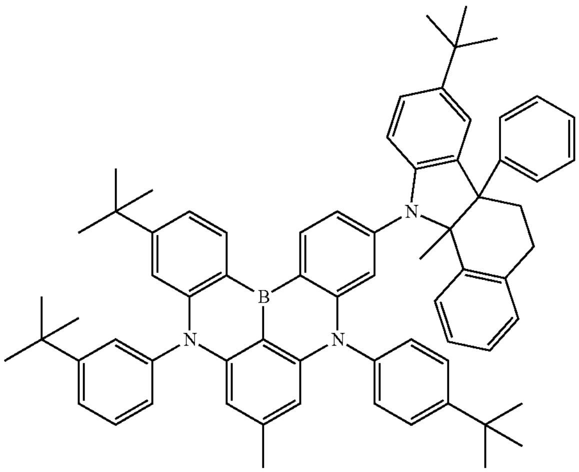
-continued
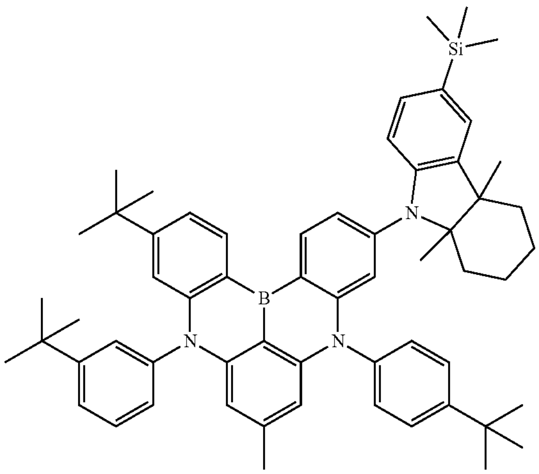
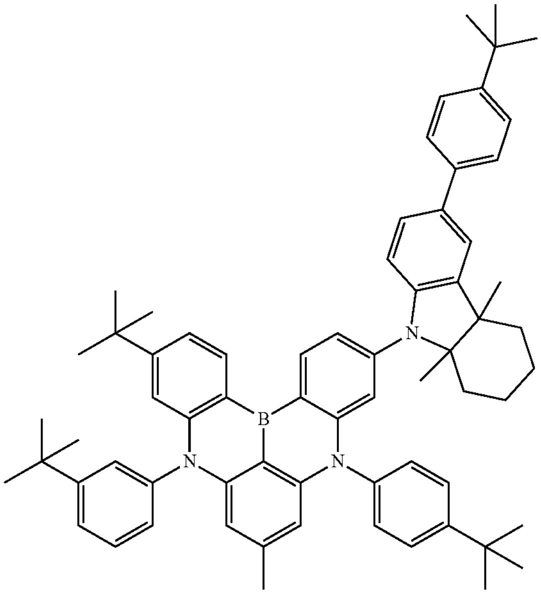
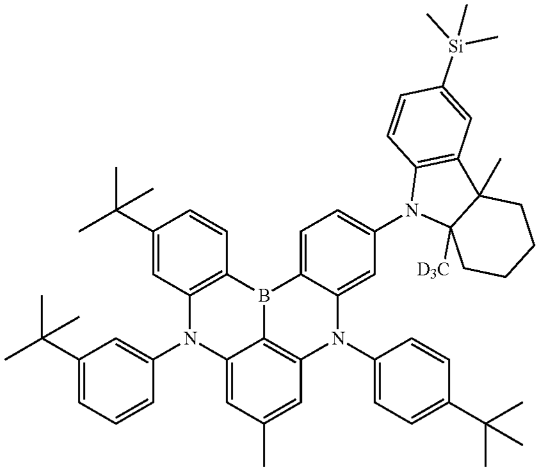

-continued
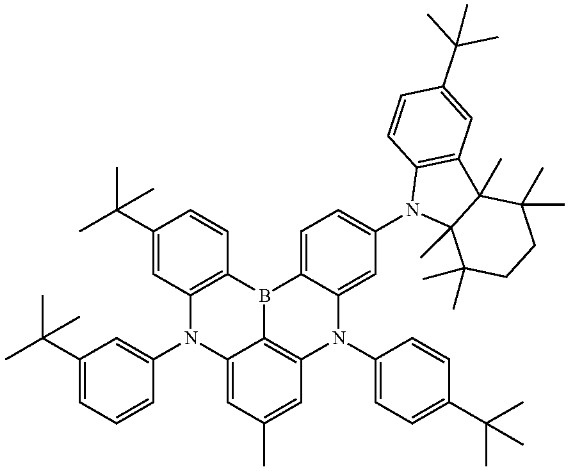
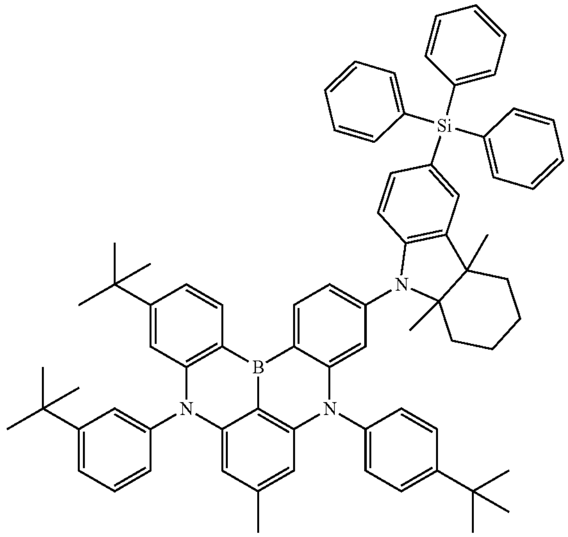
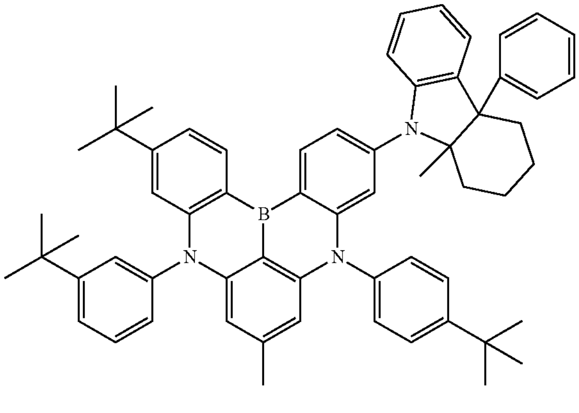
-continued
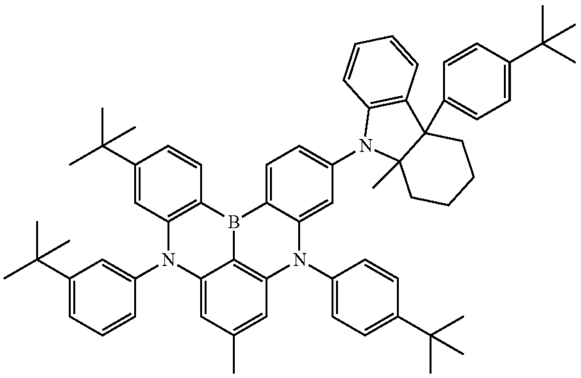
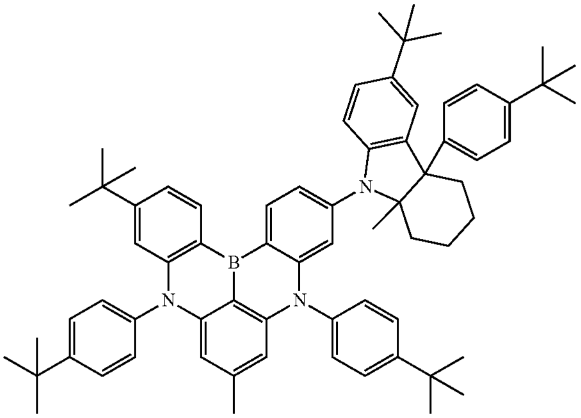
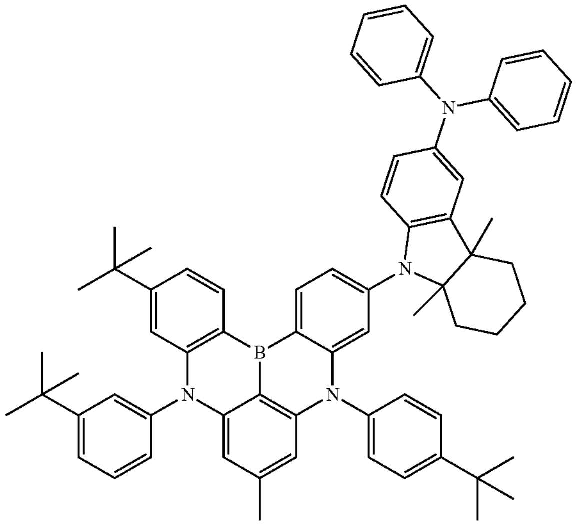
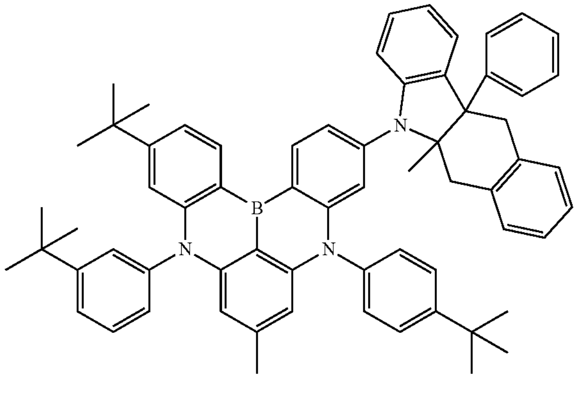

-continued
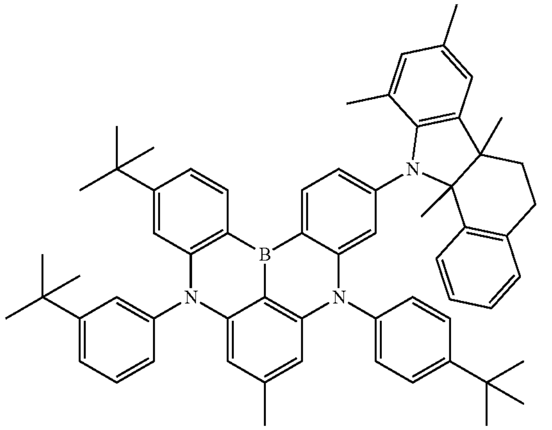
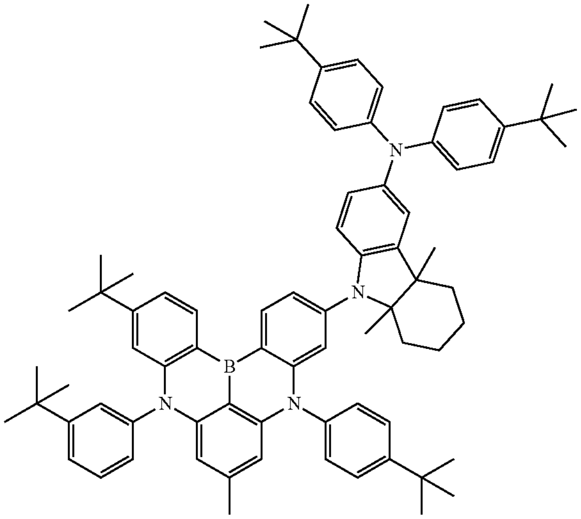
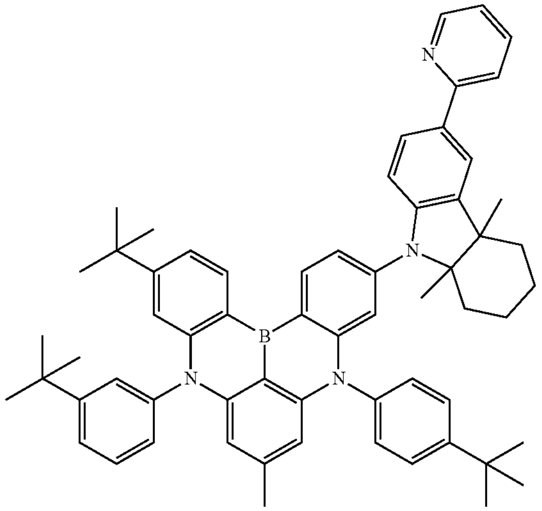
-continued
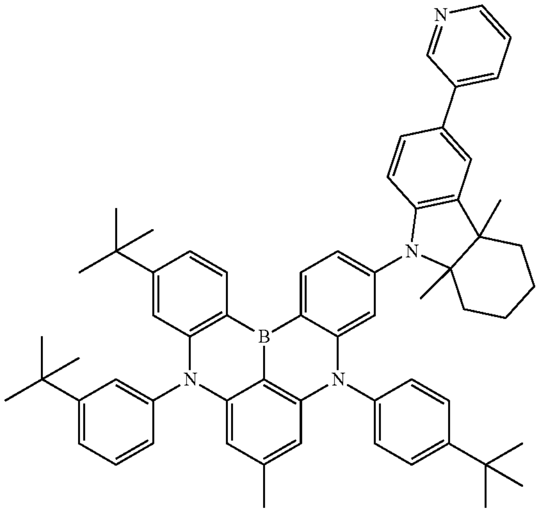
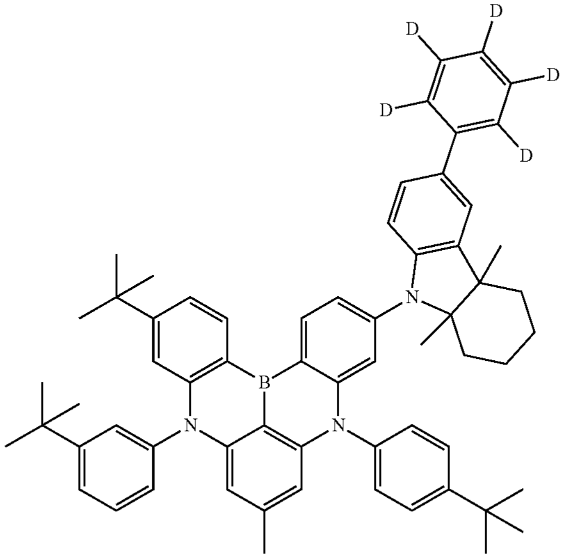
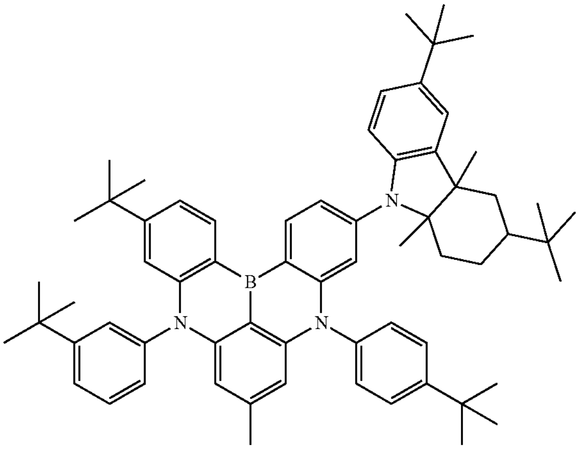

-continued
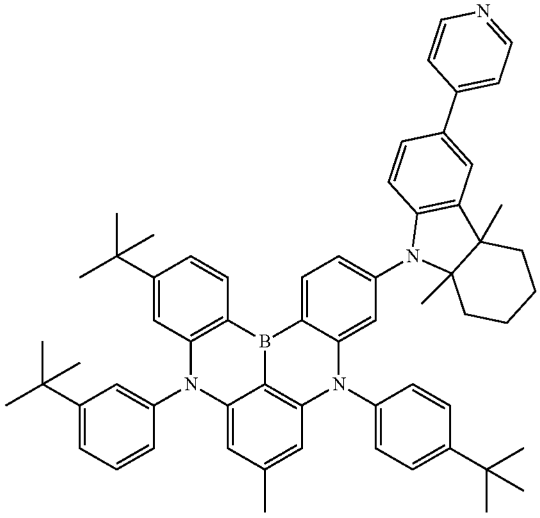
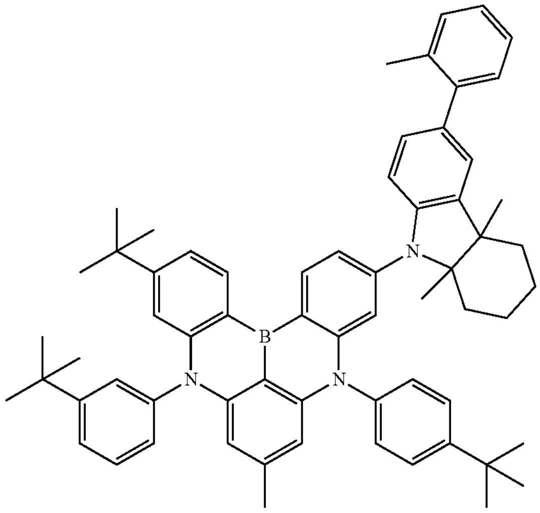
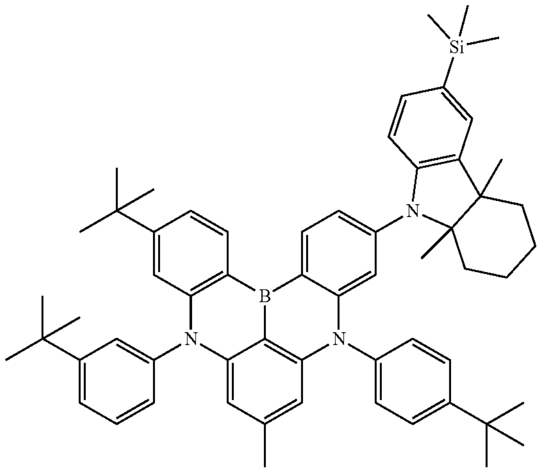
-continued
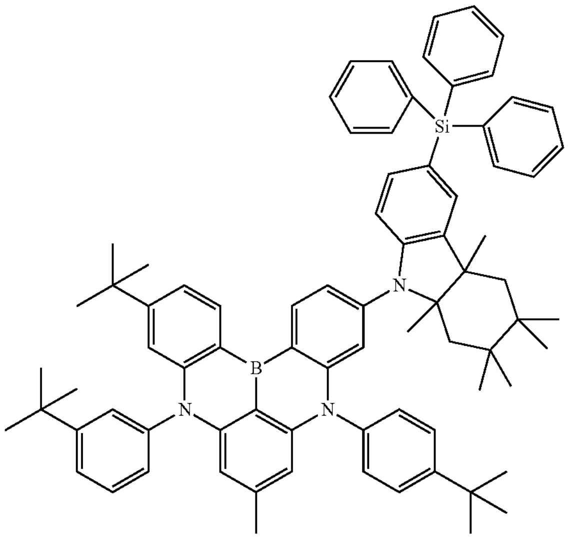
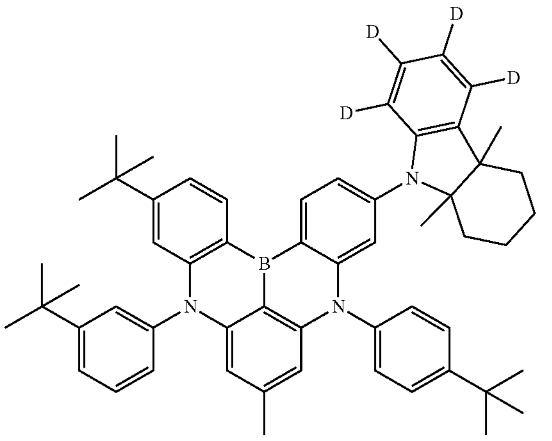
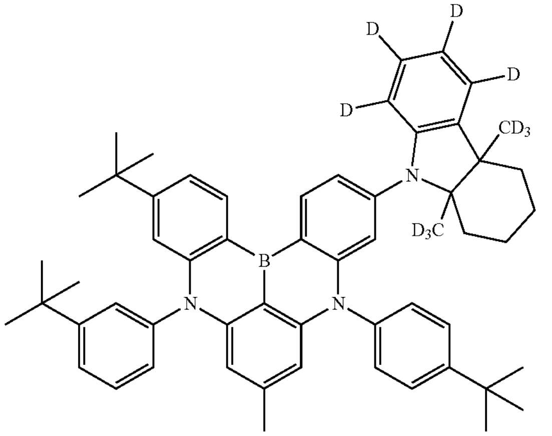

-continued
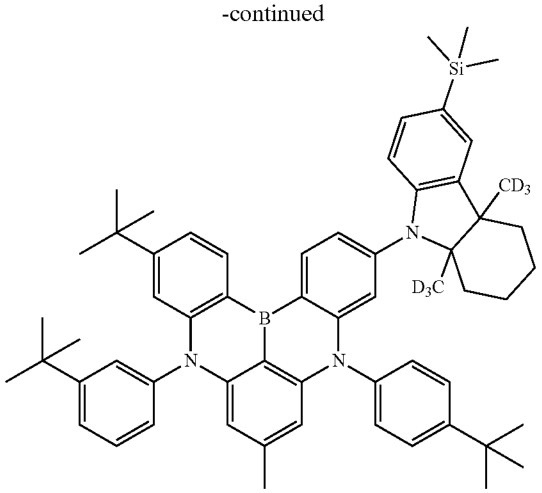
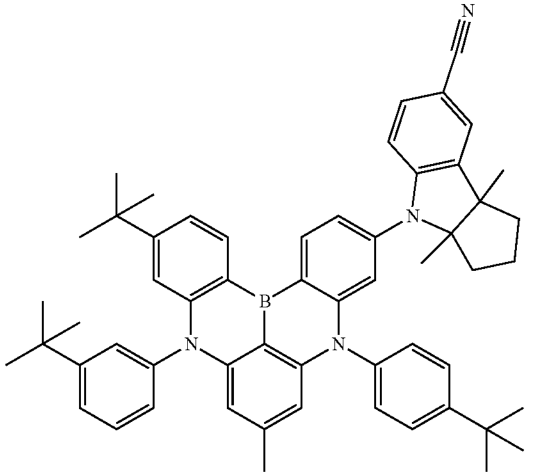
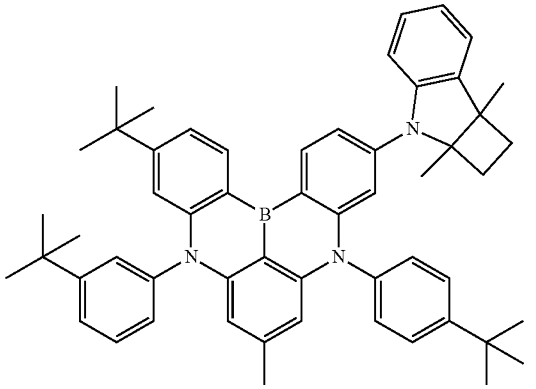
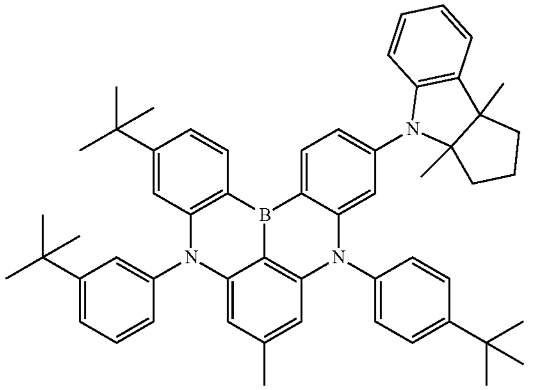
-continued
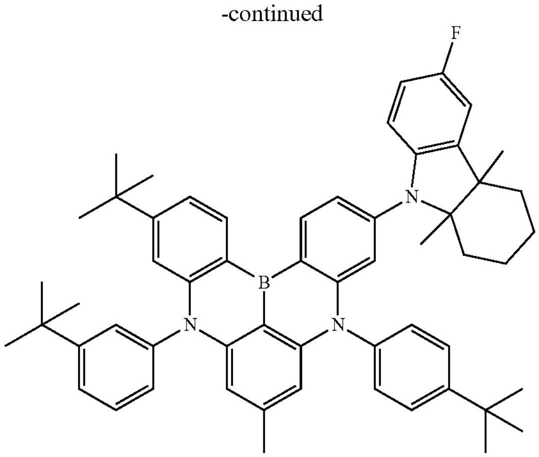
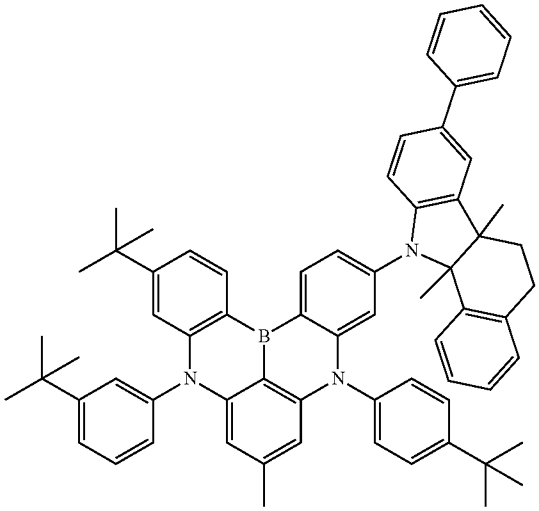
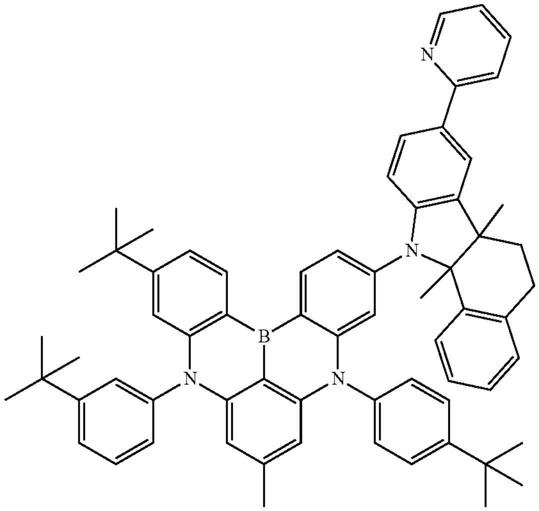

-continued
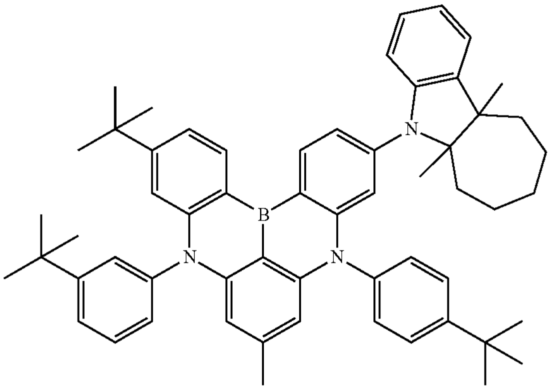
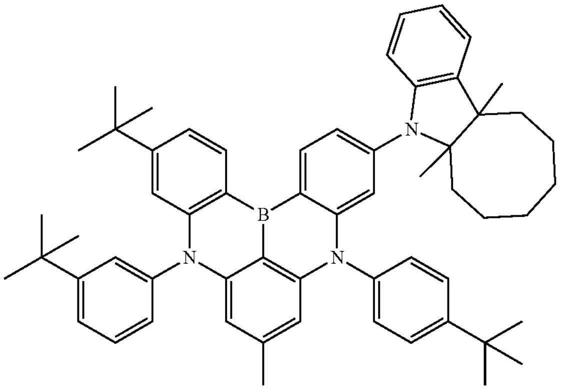
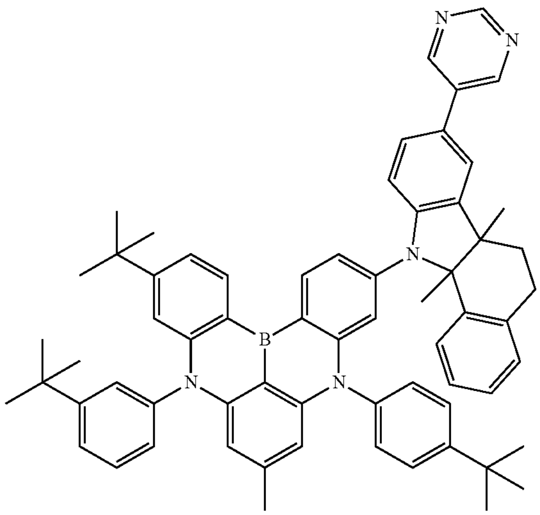
-continued
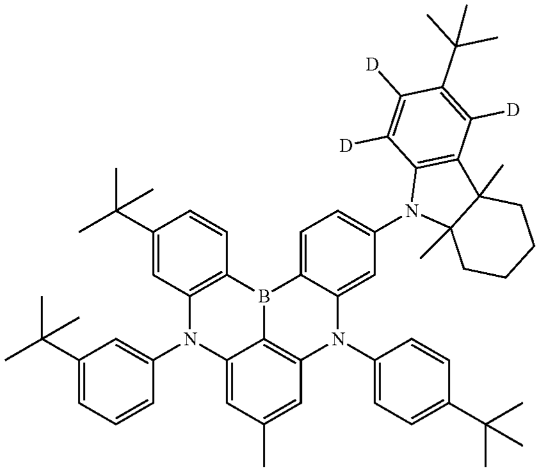
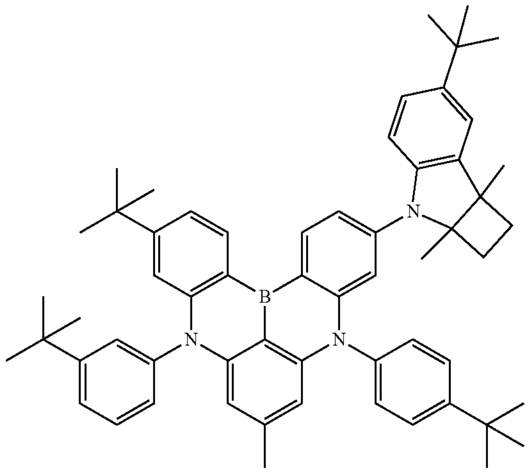
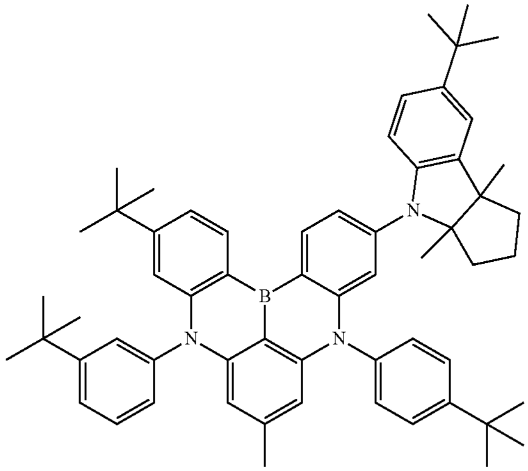

-continued
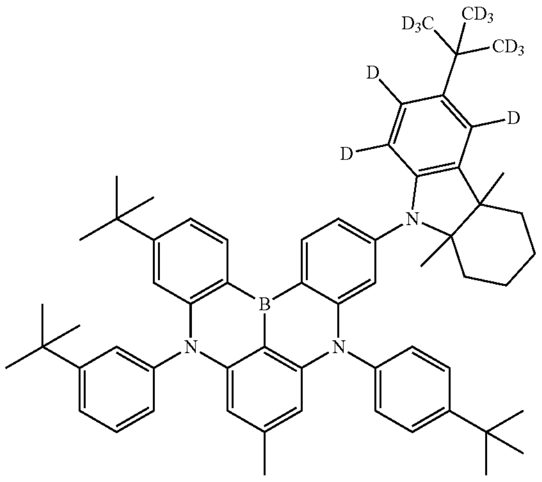
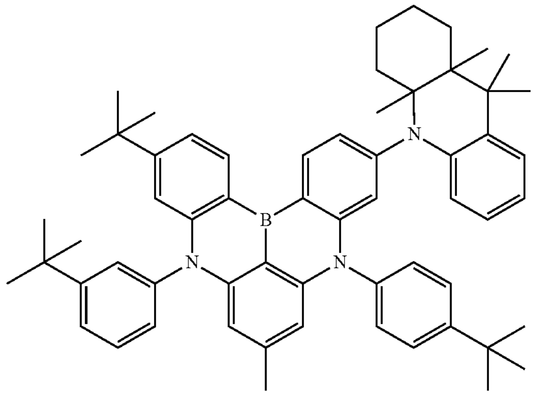
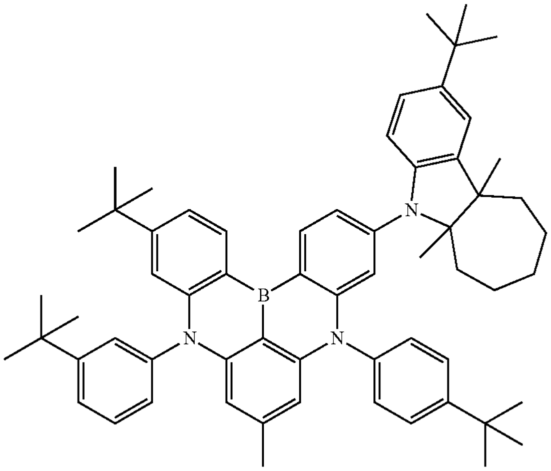
-continued
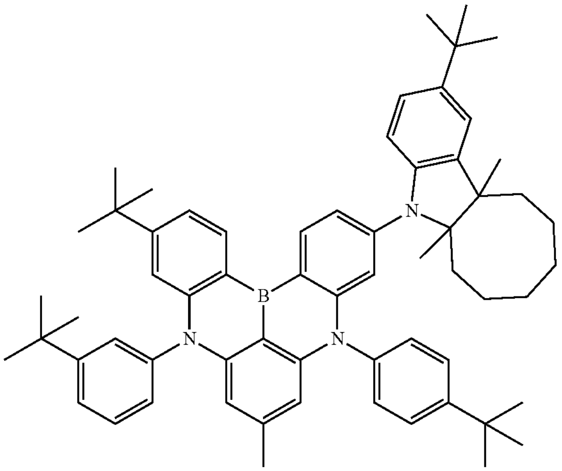
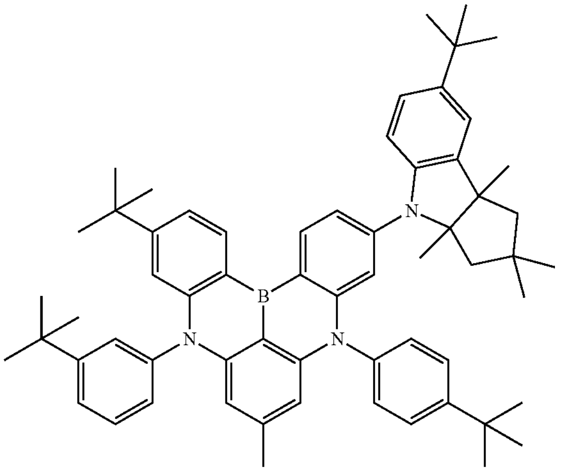
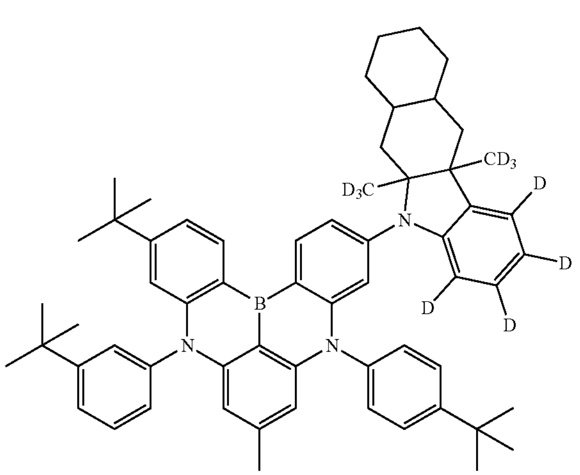

-continued
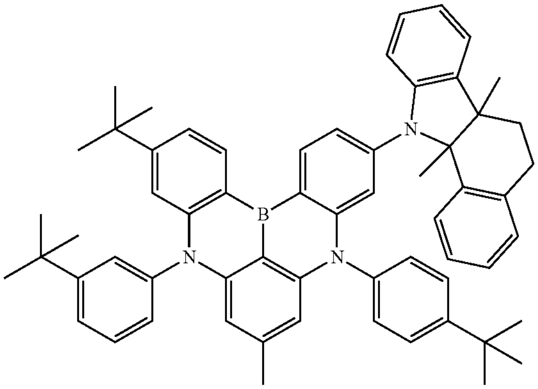
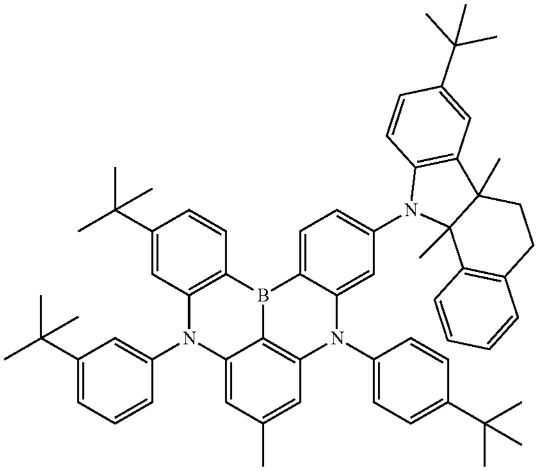
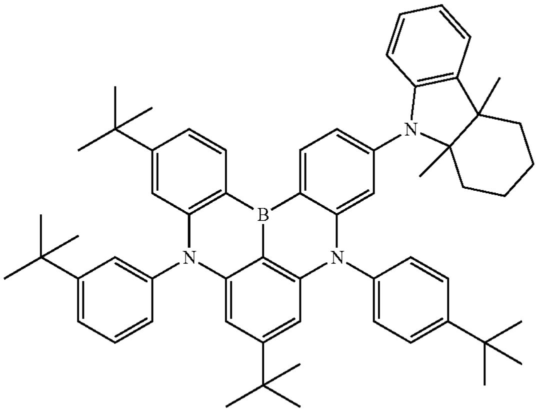
-continued
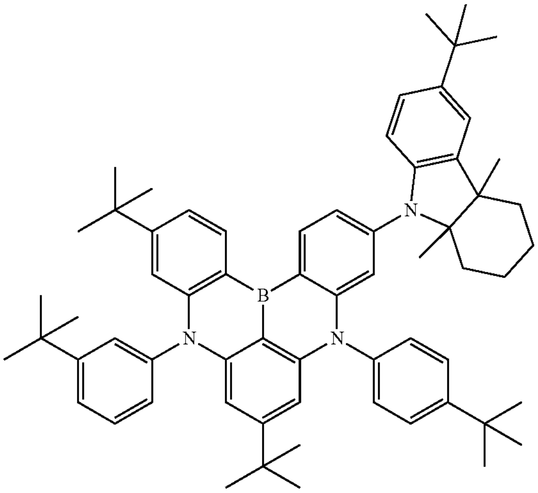
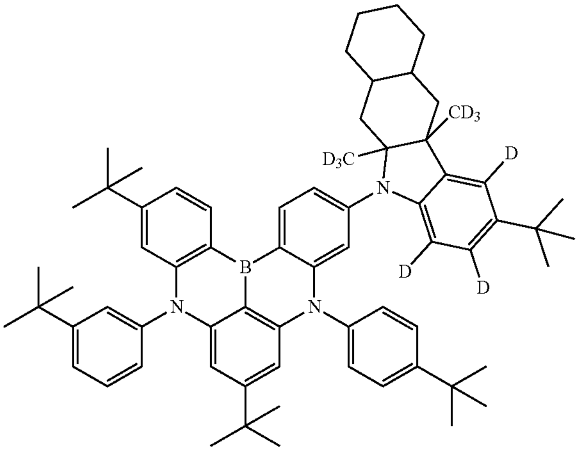
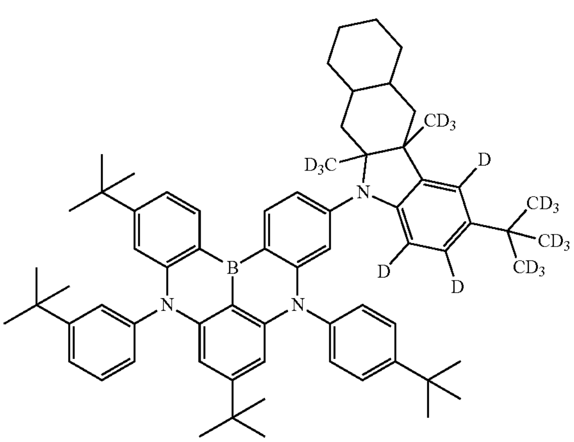

-continued
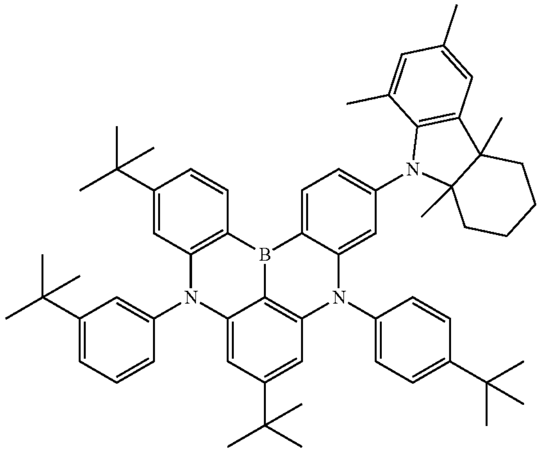
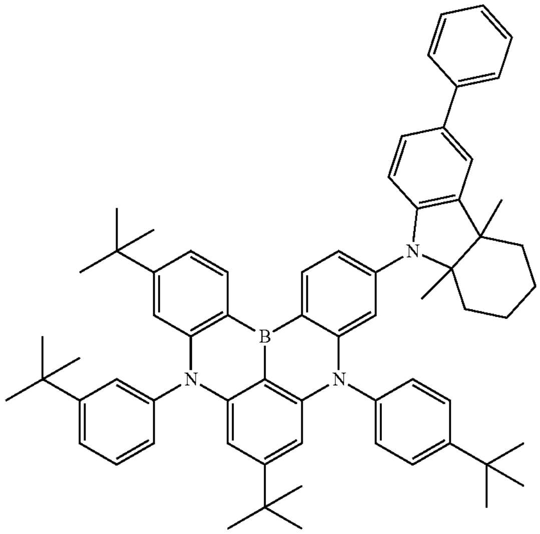
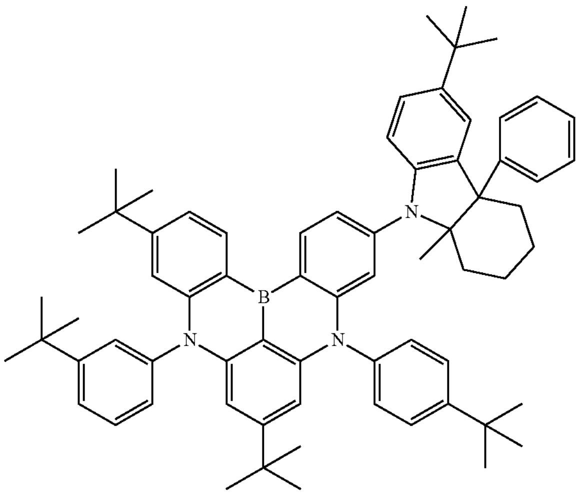
-continued
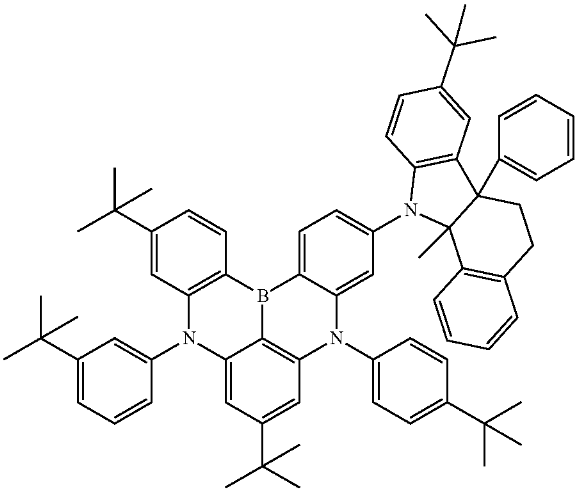
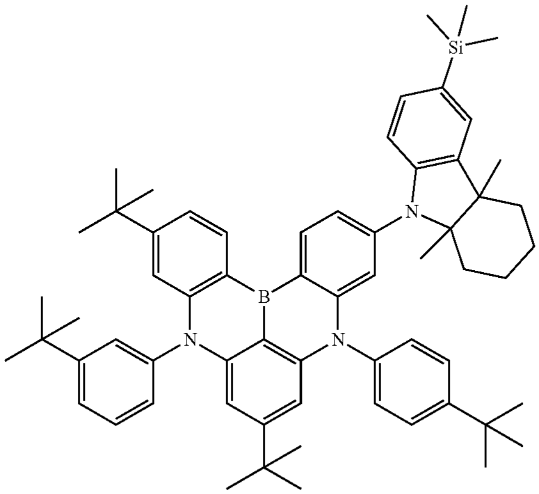
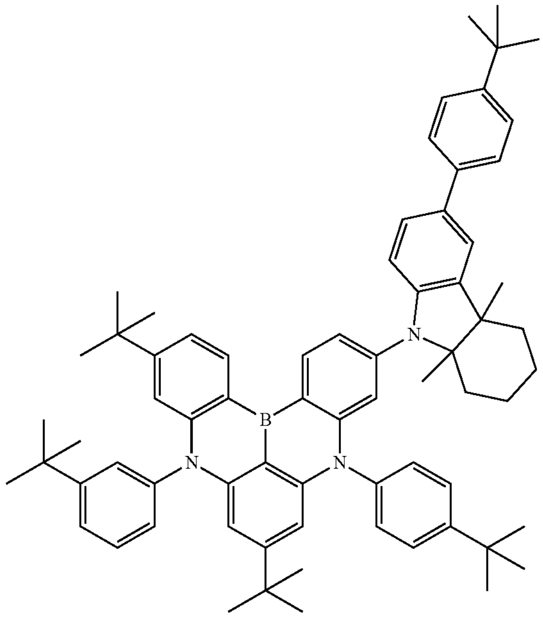

-continued
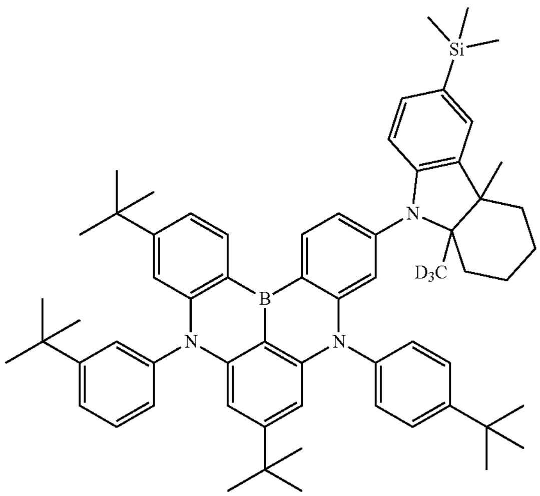
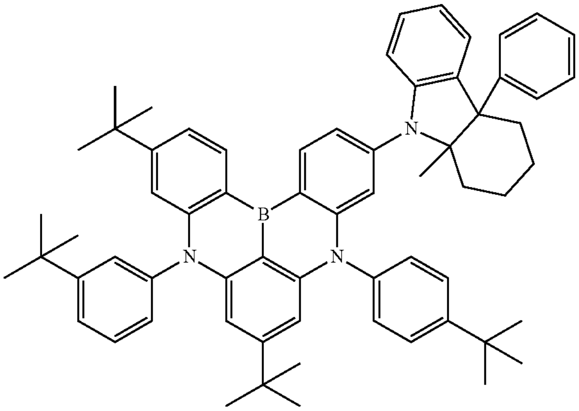
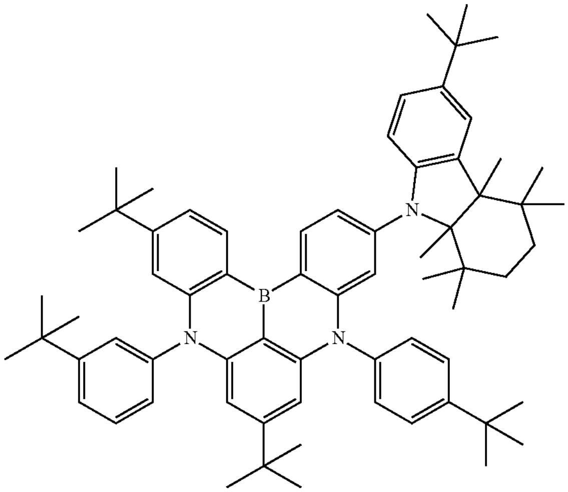
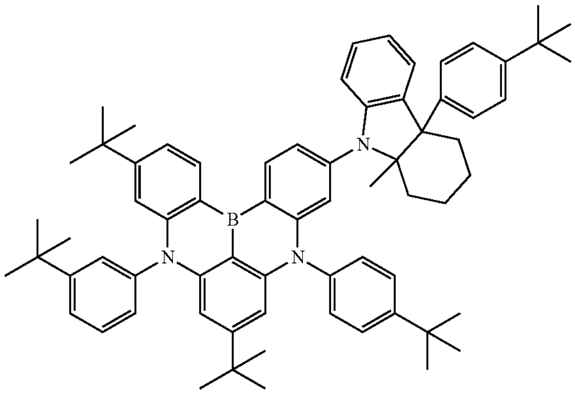
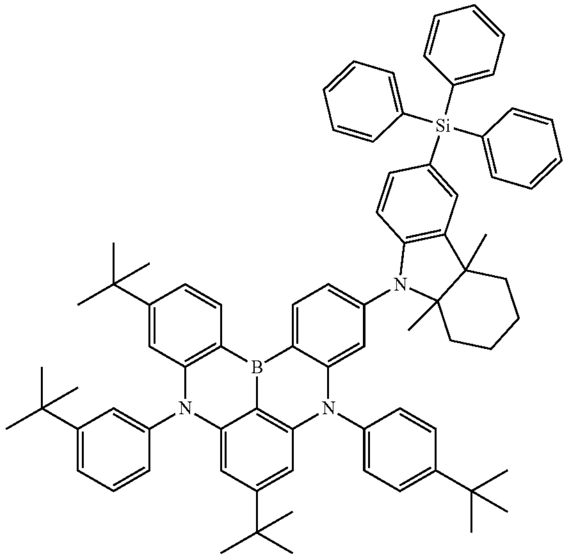
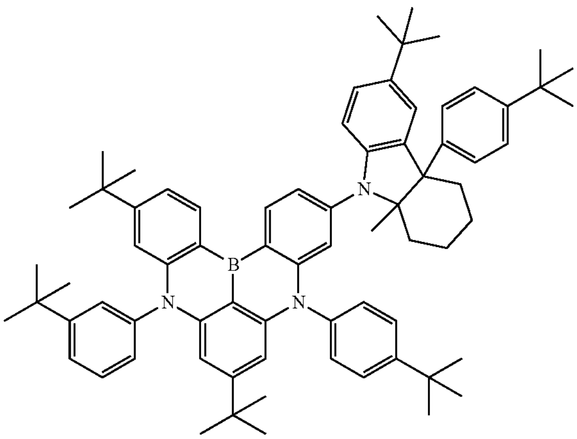
-continued -continued
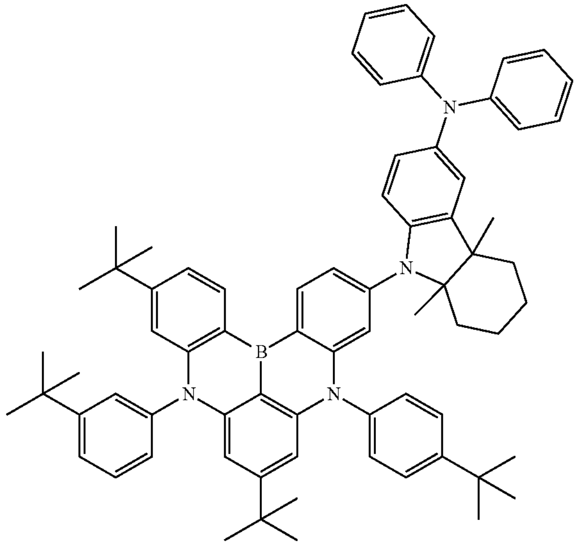
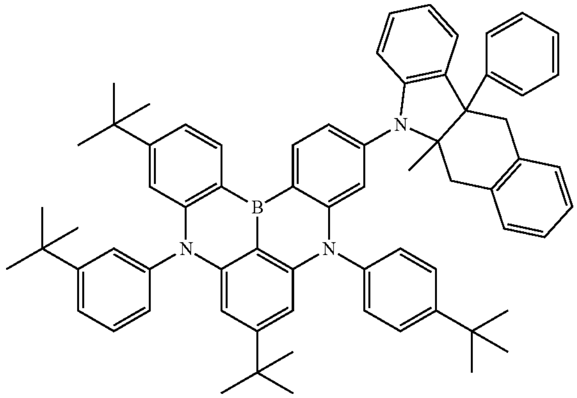
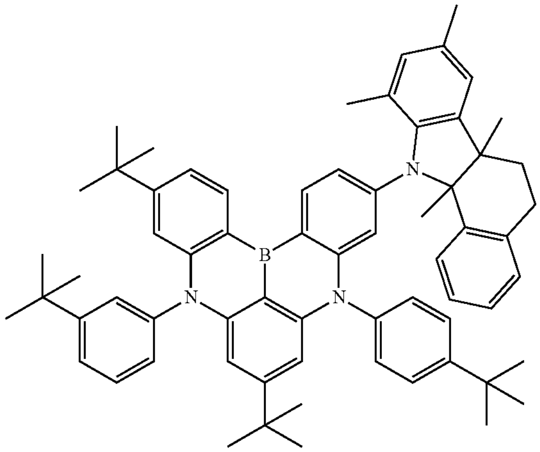
-continued
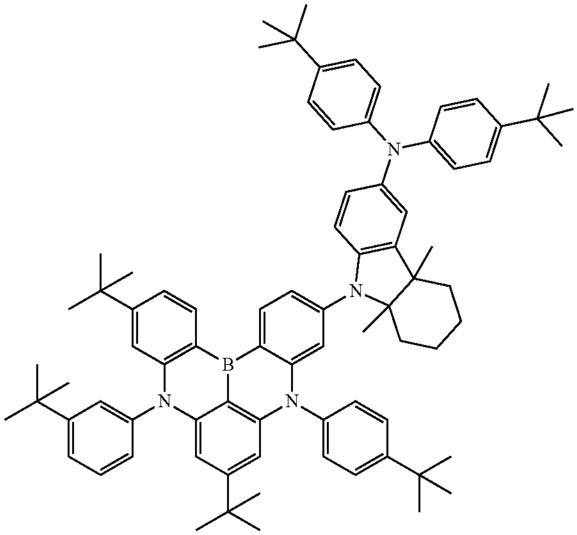
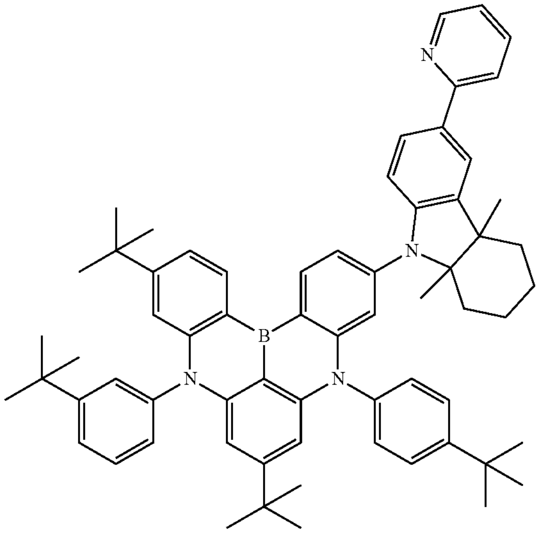
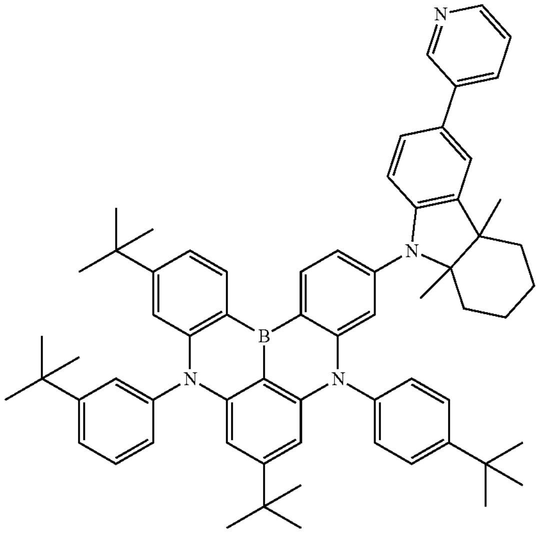

-continued
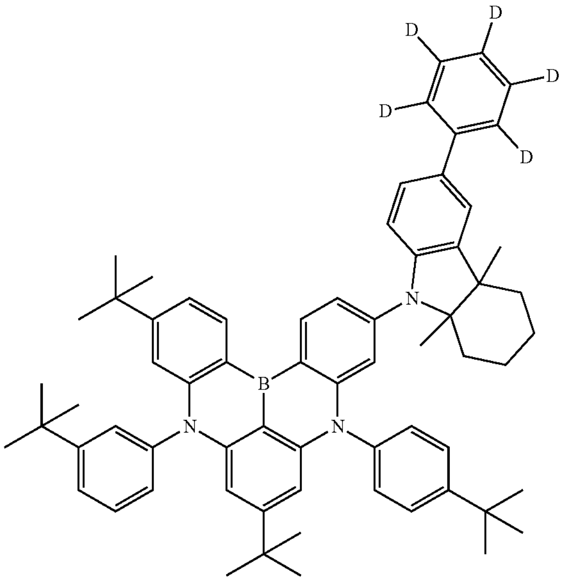
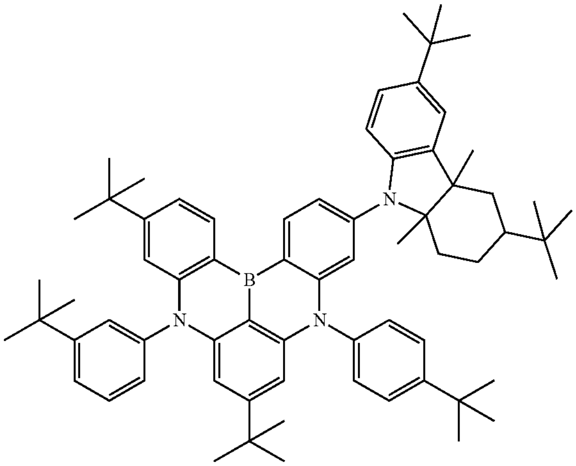
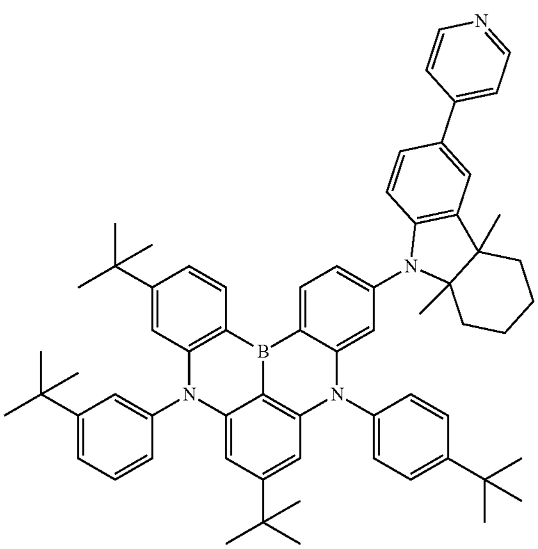
-continued
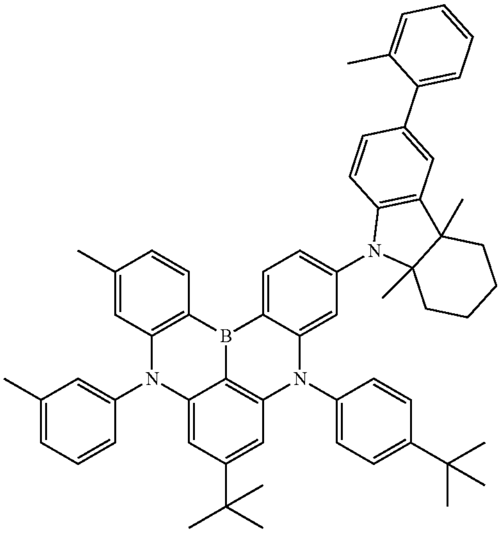
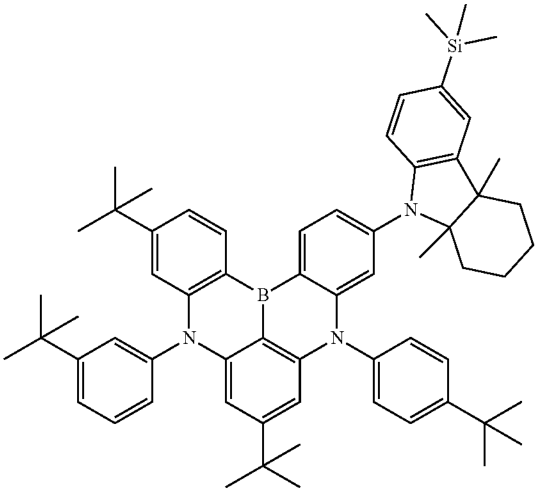
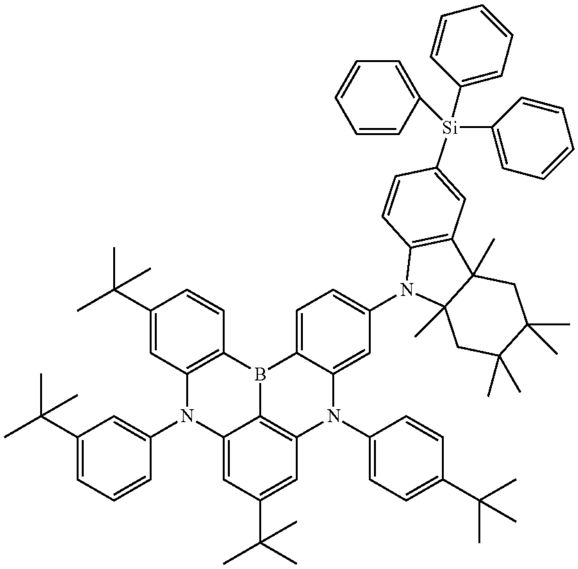

-continued
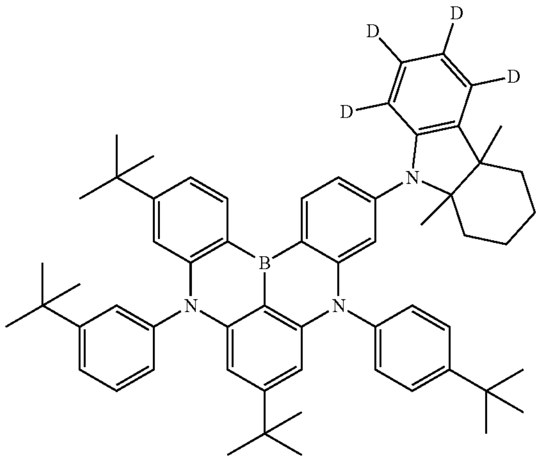
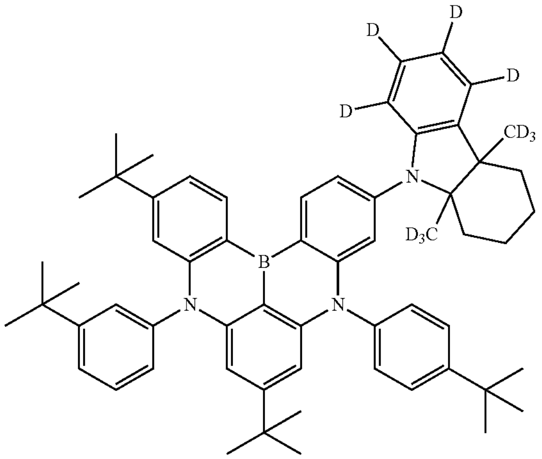
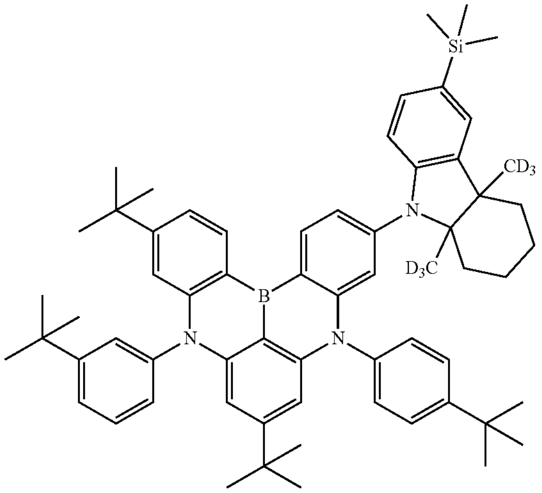
-continued
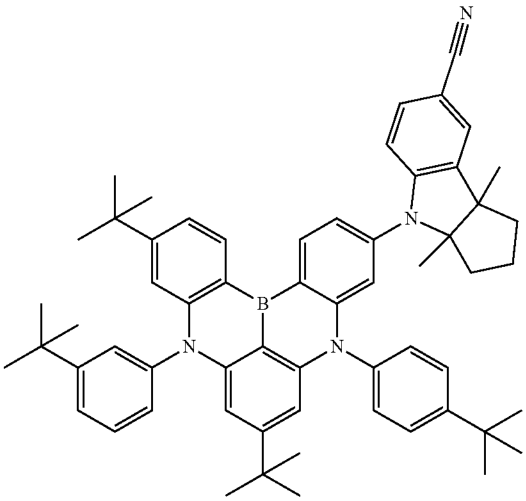
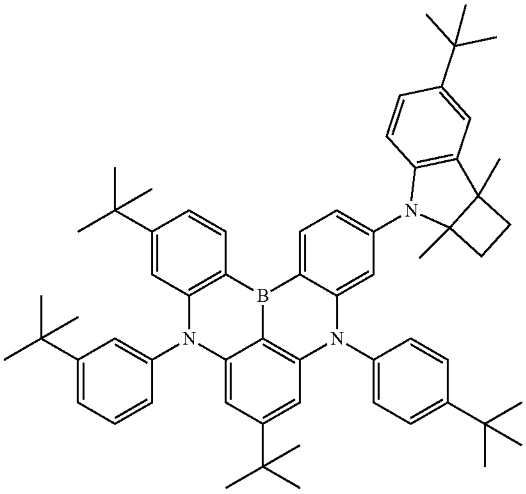
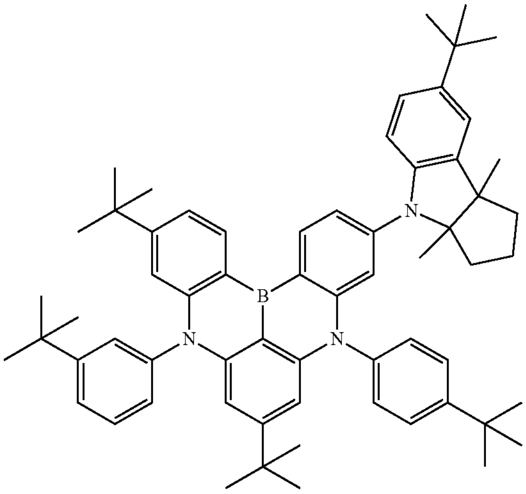

-continued
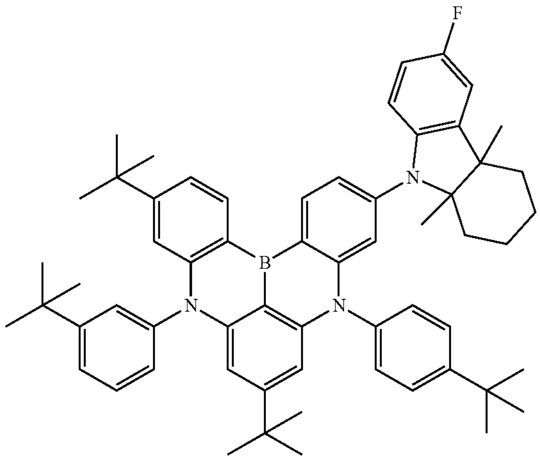 [SMILES: CC(C)(C)c1ccc(N2c3cc(N4c5ccc(F)cc5C5(C)CCCCC45C)ccc3B3c4ccc(C(C)(C)C)cc4N(c4cccc(C(C)(C)C)c4)c4cc(C(C)(C)C)cc2c43)cc1]
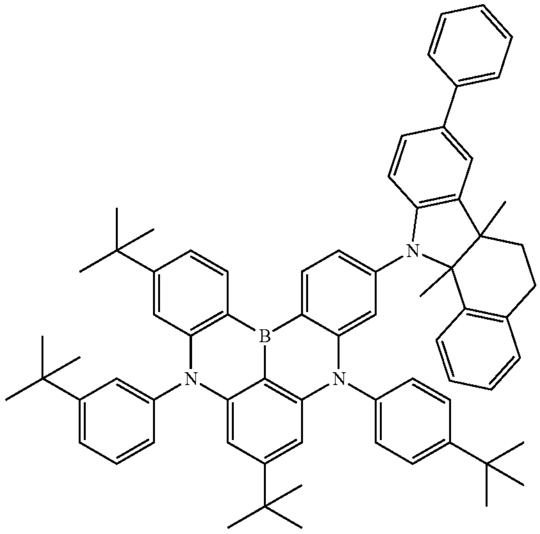
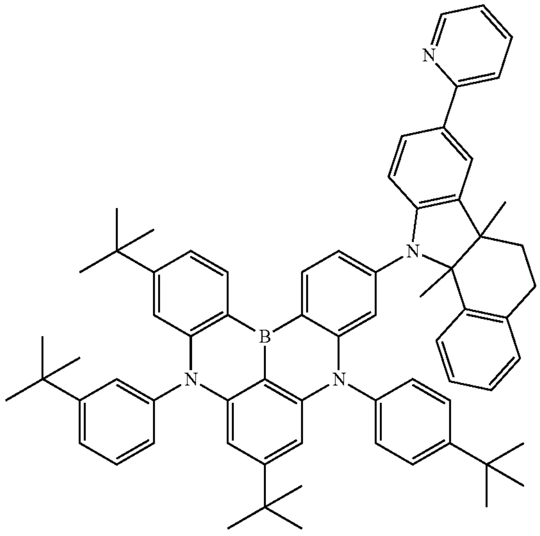
-continued
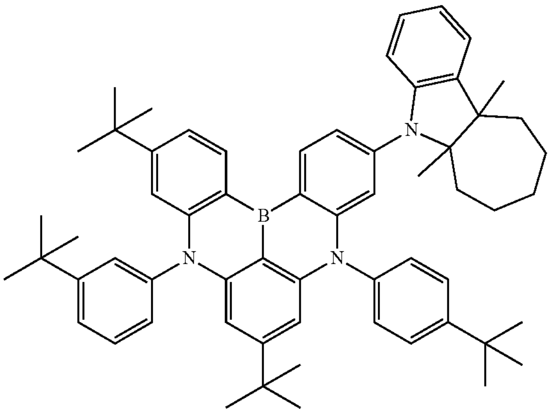
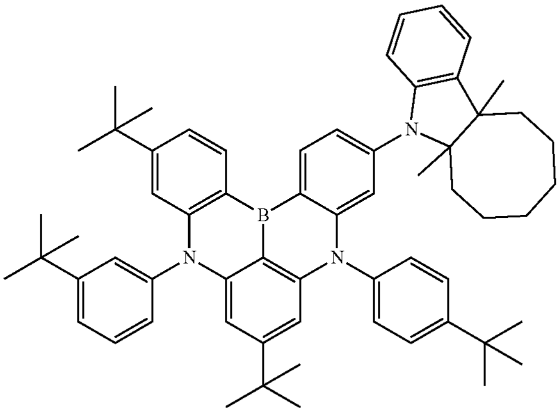
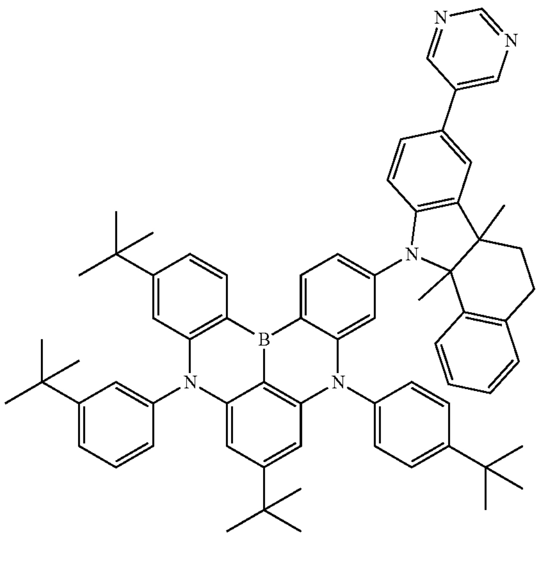

-continued
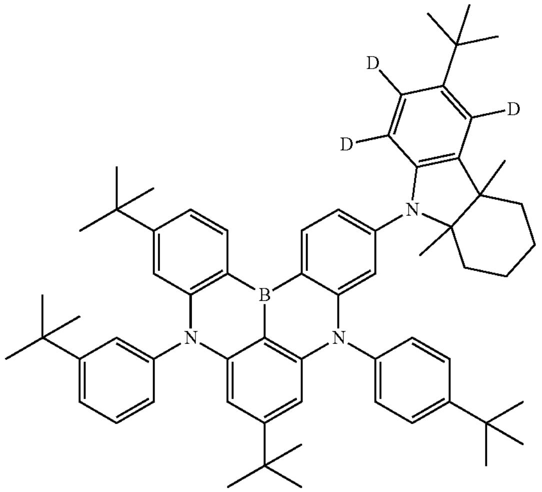
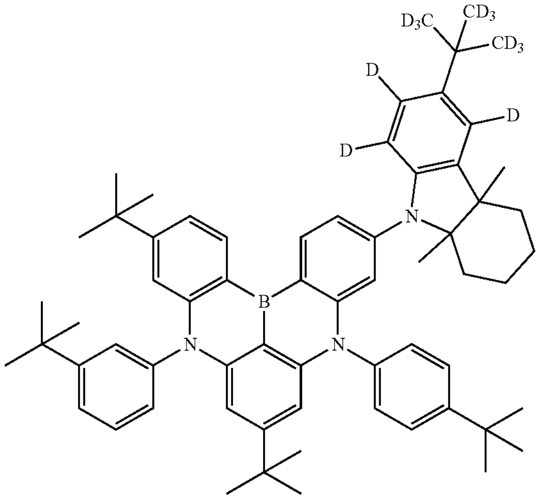
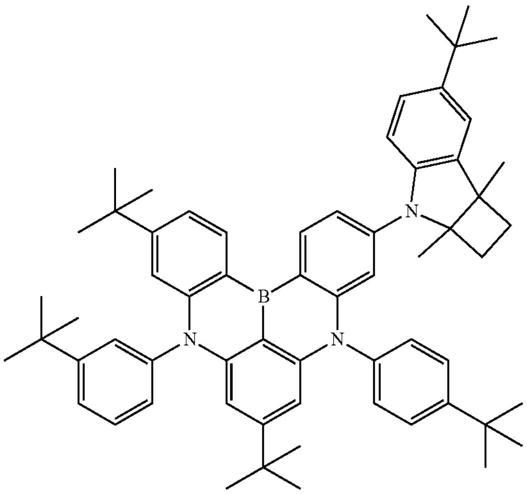
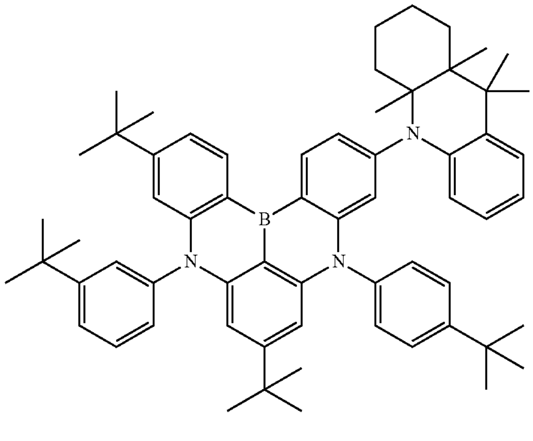
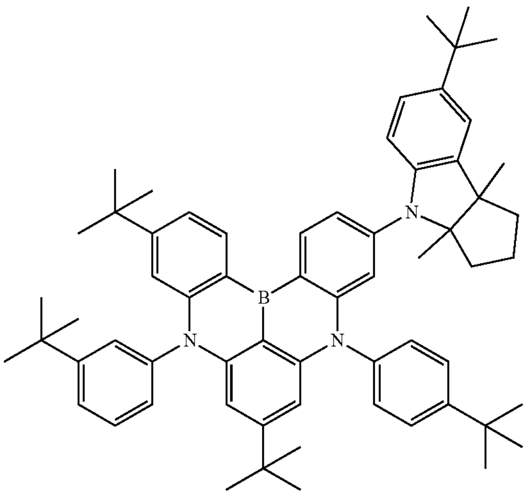
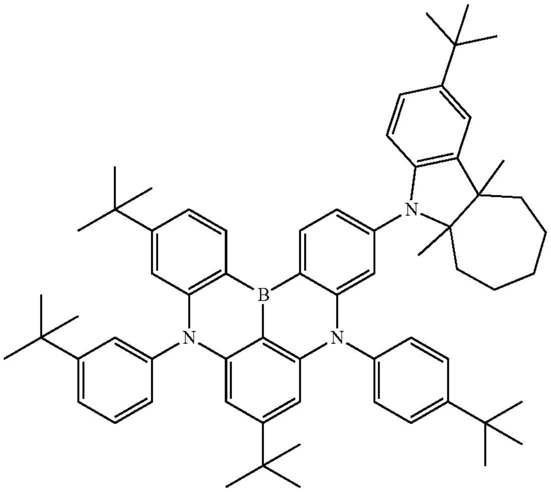
-continued -continued
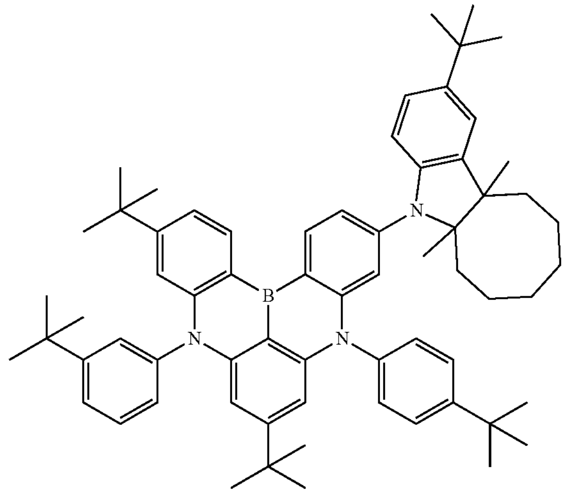
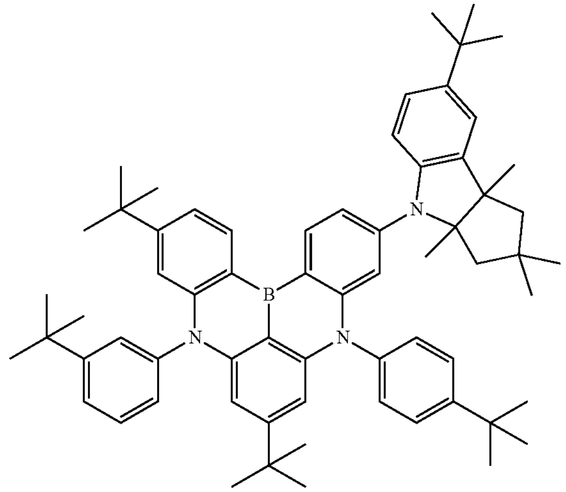
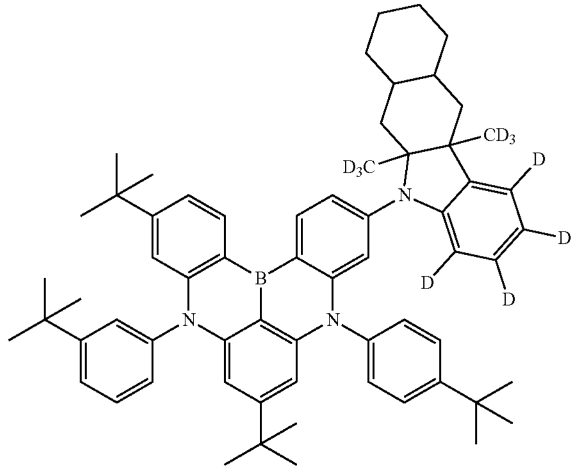
-continued
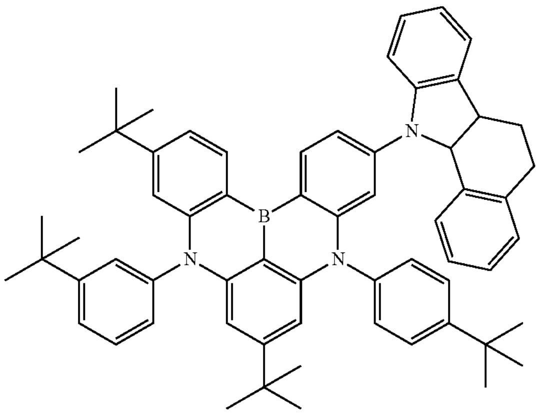
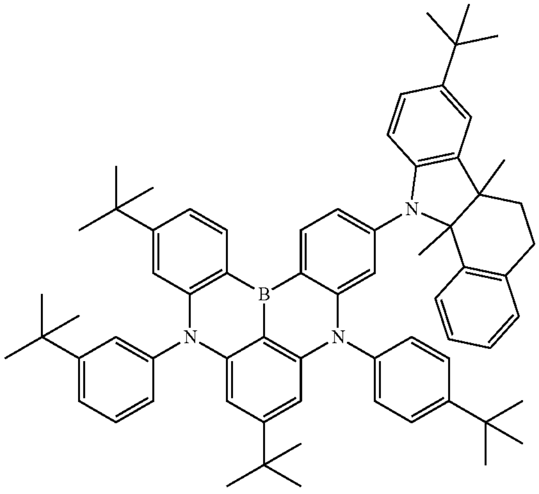
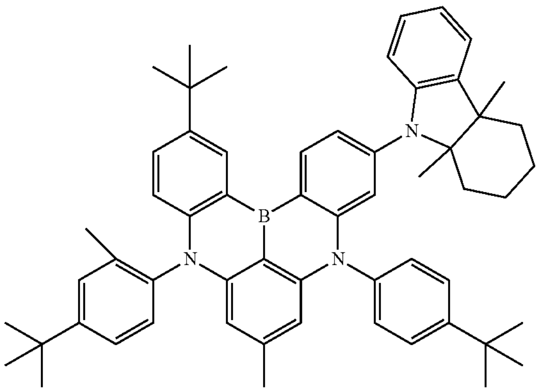

-continued
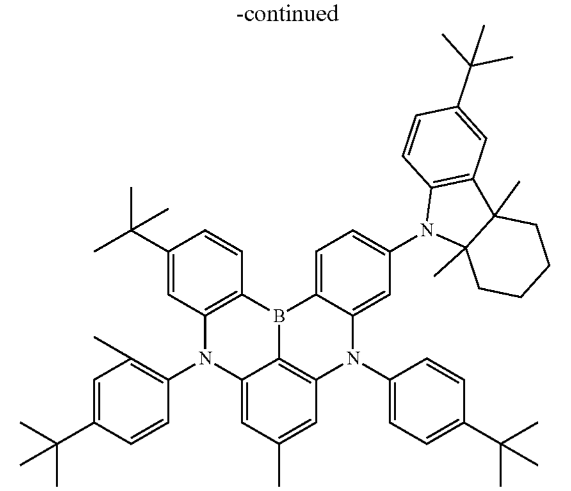
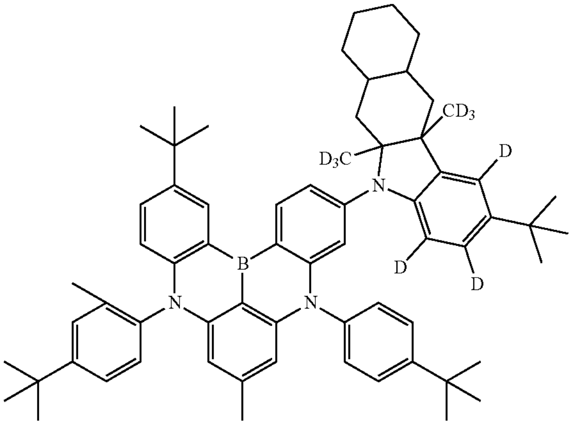
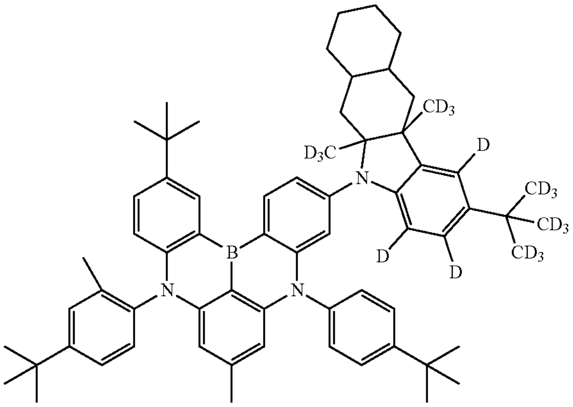
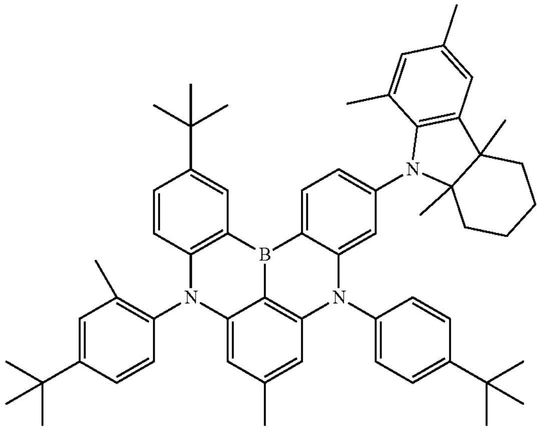
-continued
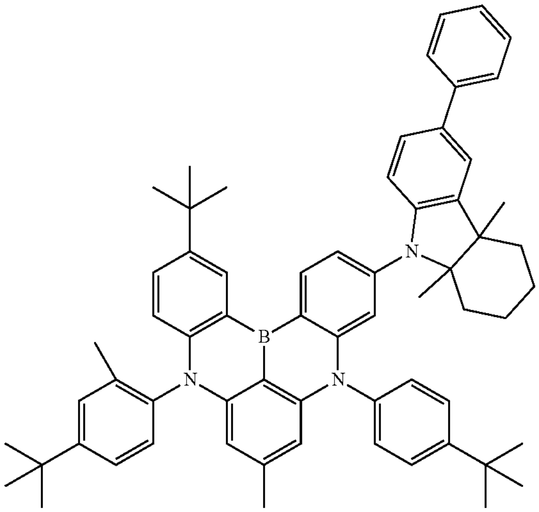
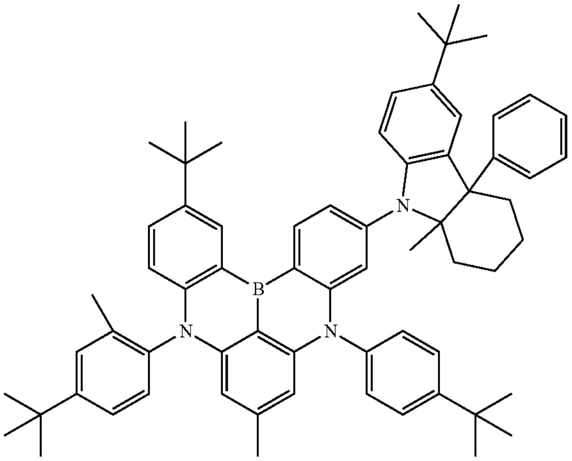
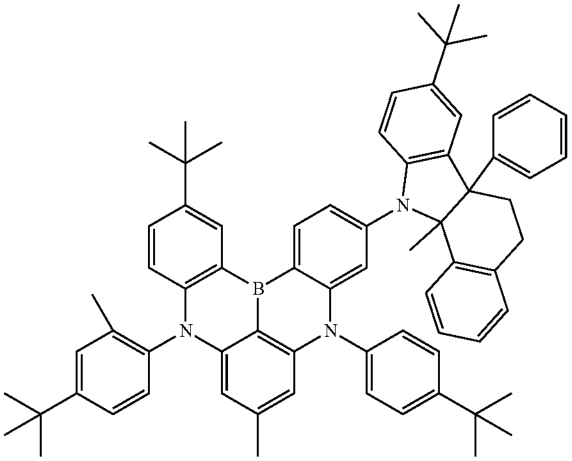

-continued
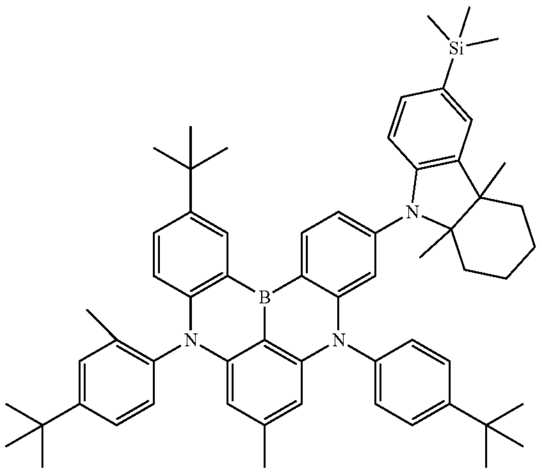
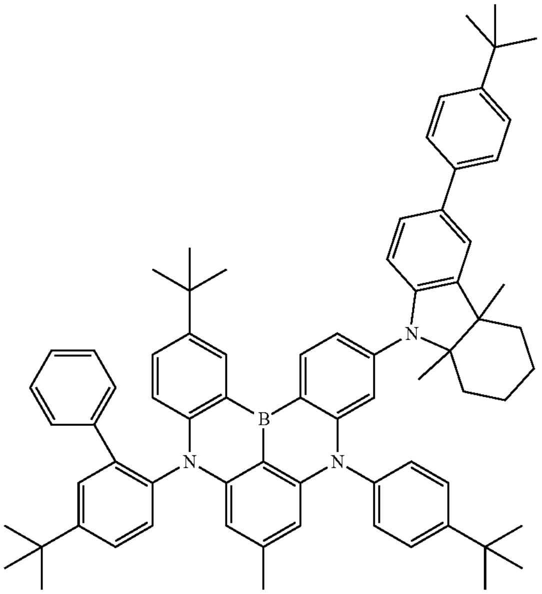
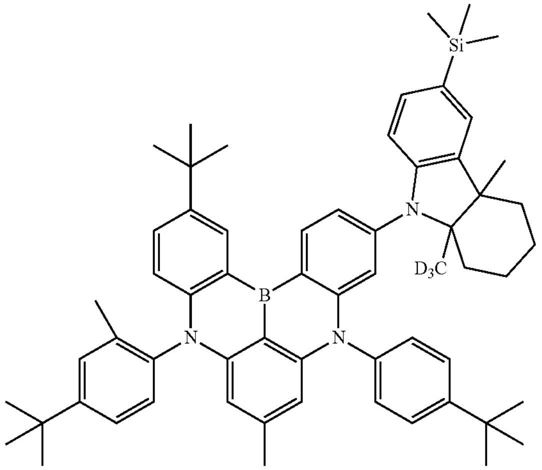
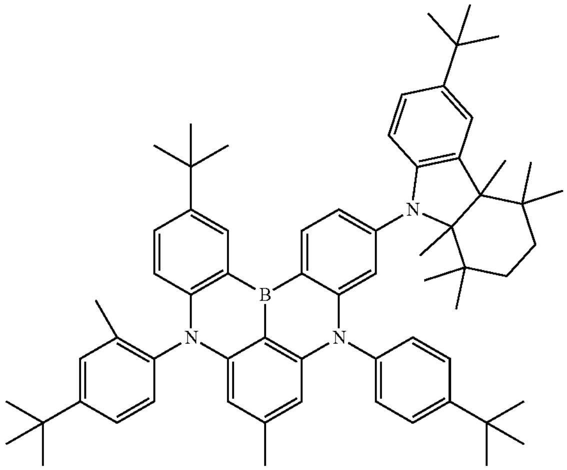
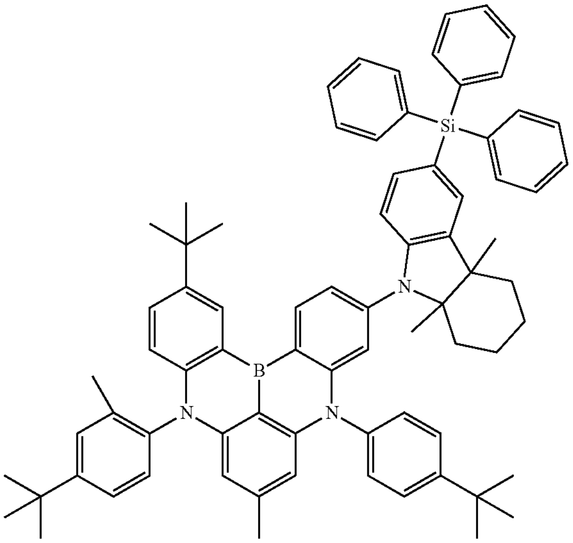
-continued
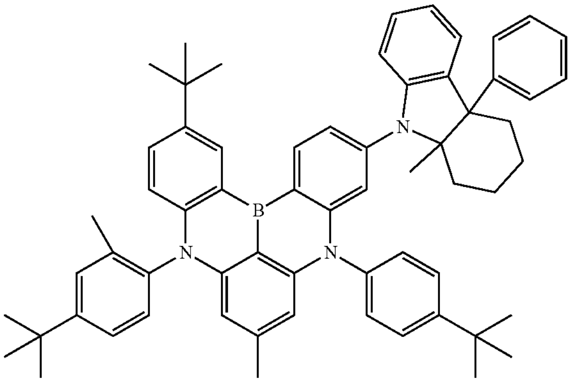

-continued
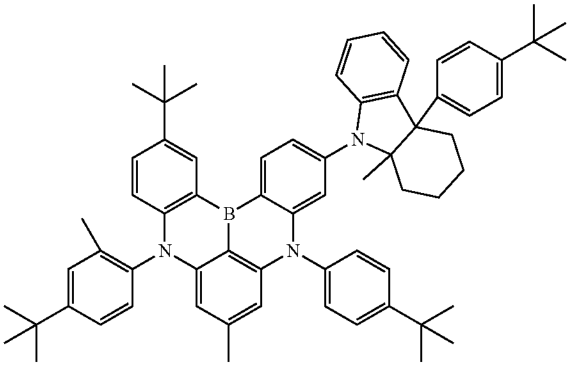
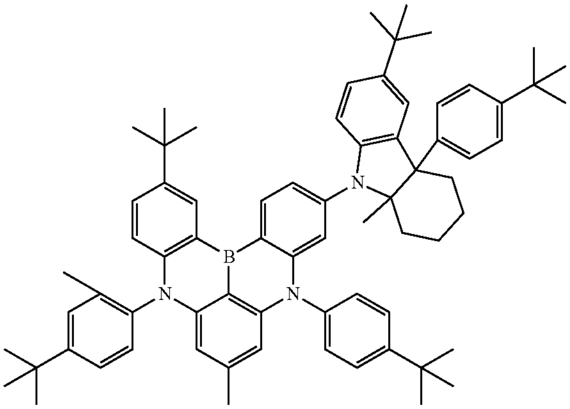
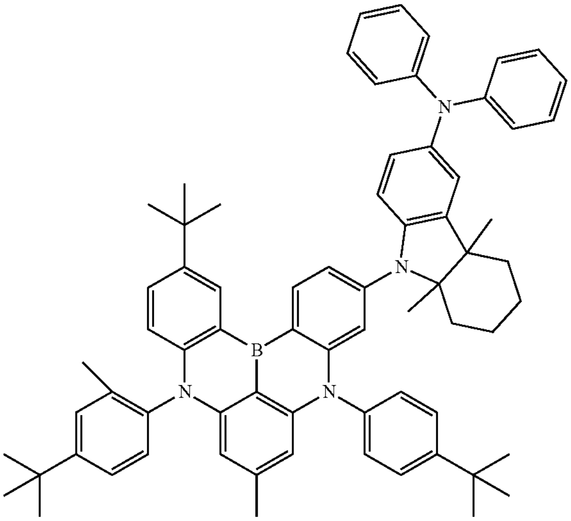
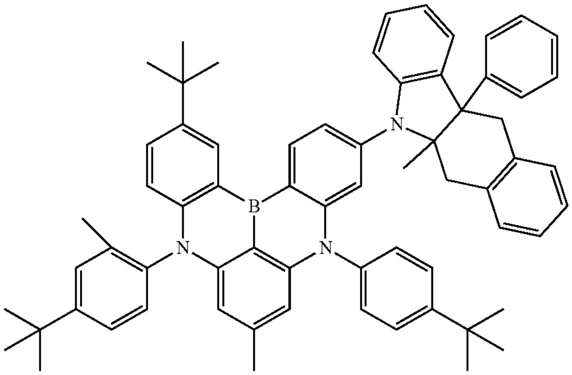
-continued
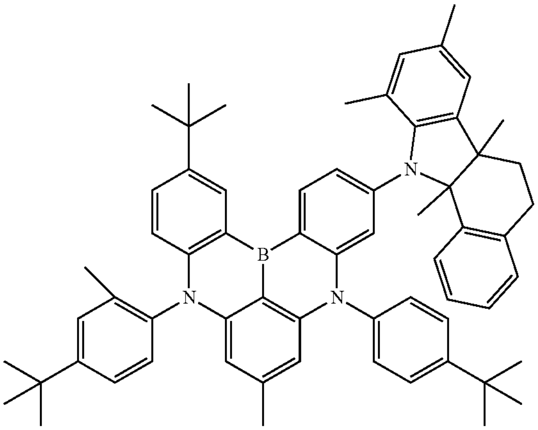
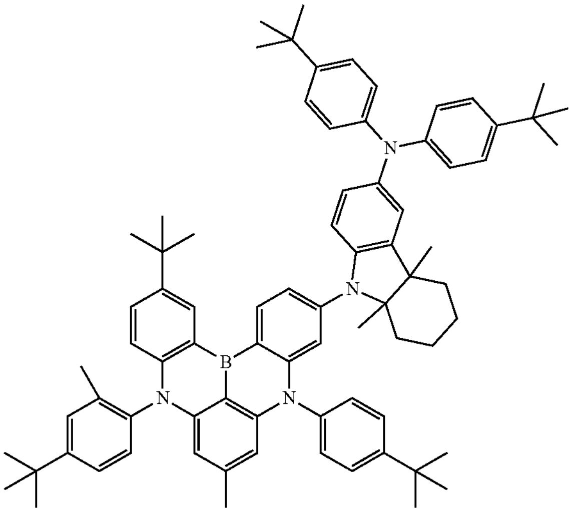
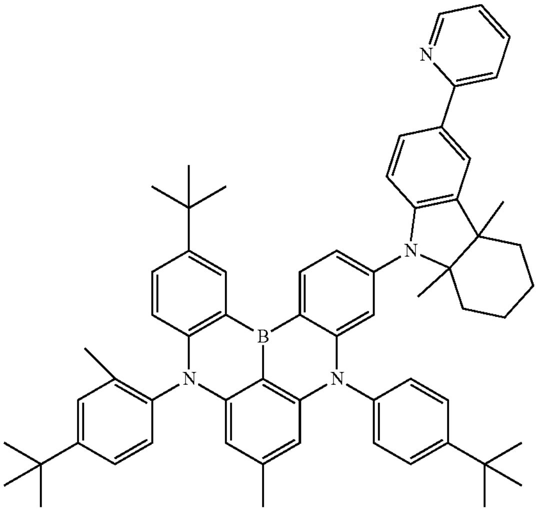

-continued
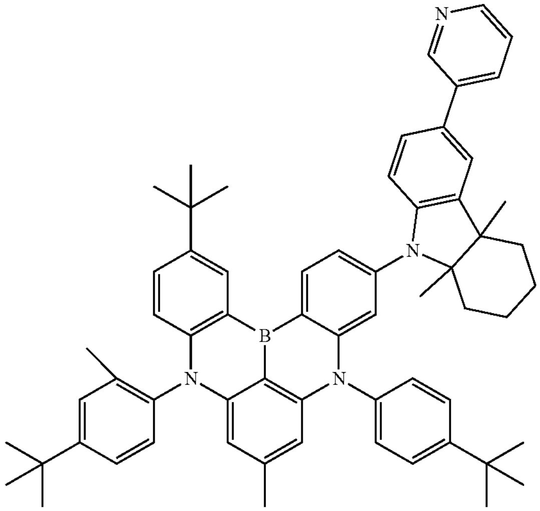
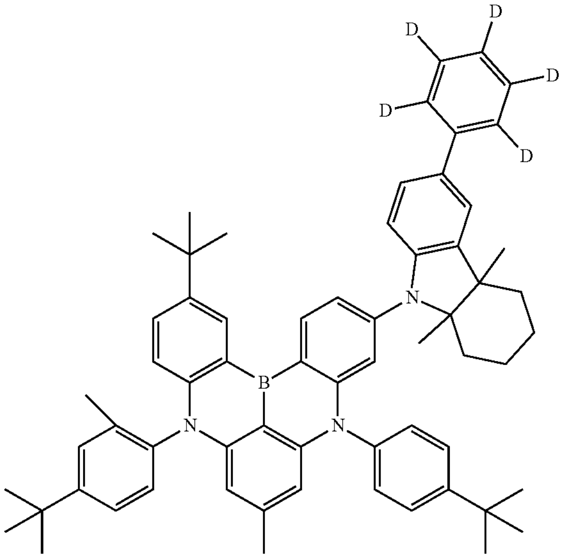
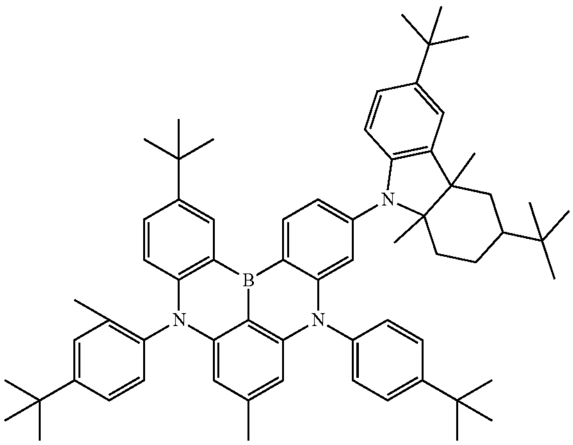
-continued
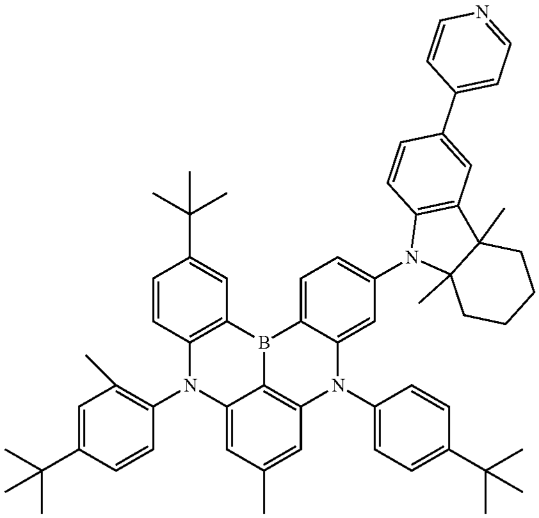
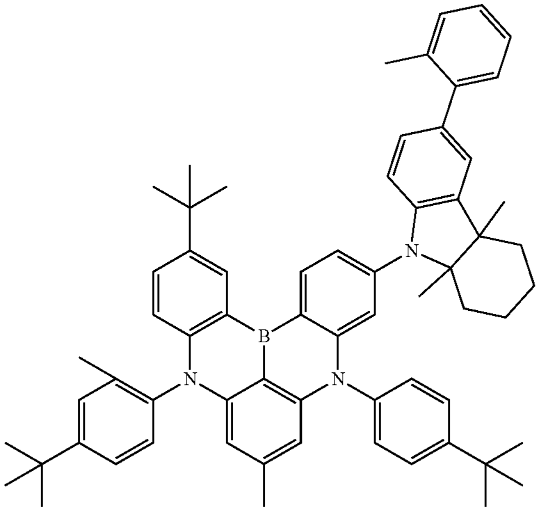
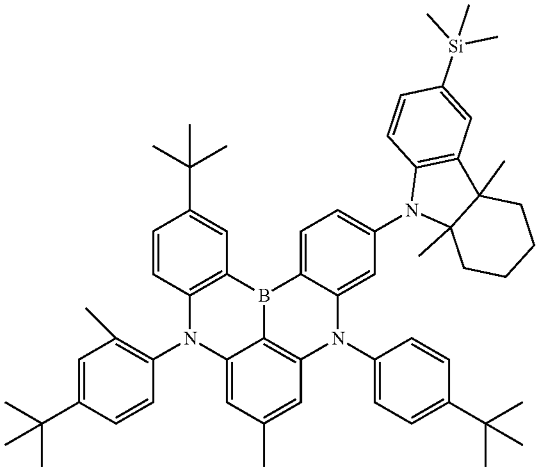

-continued
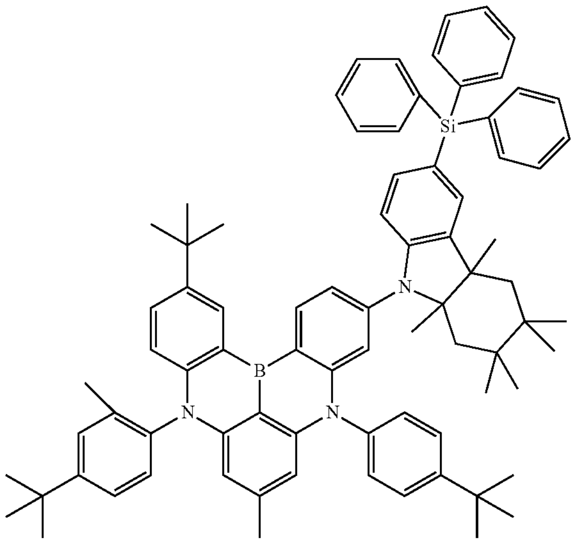
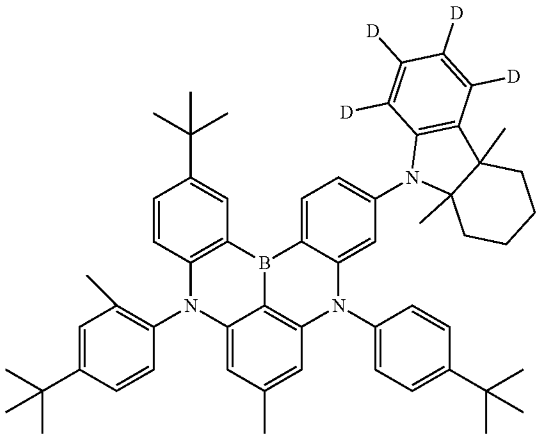
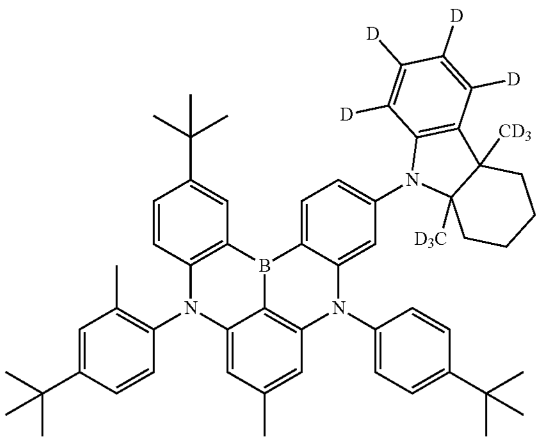
-continued
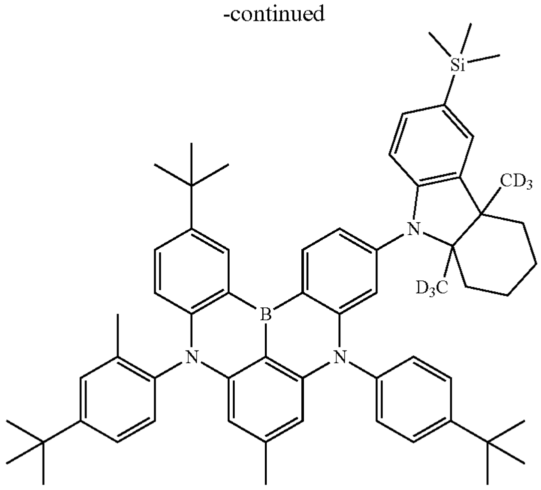
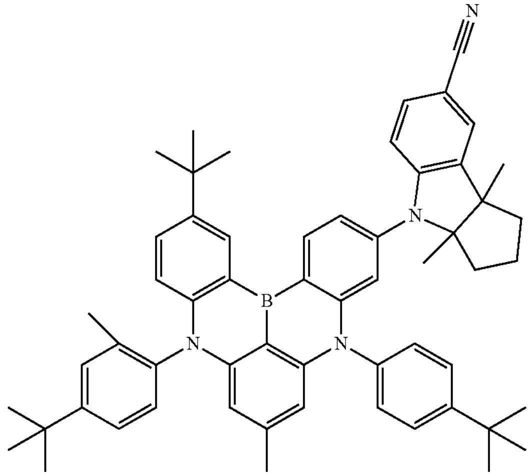
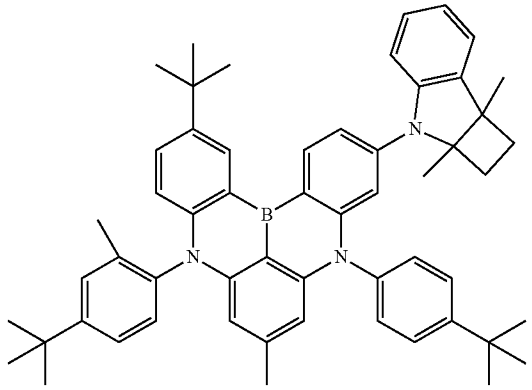
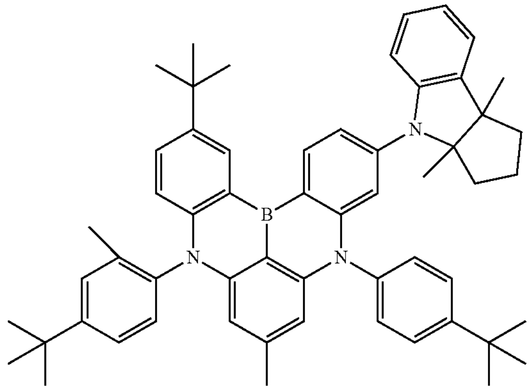

-continued
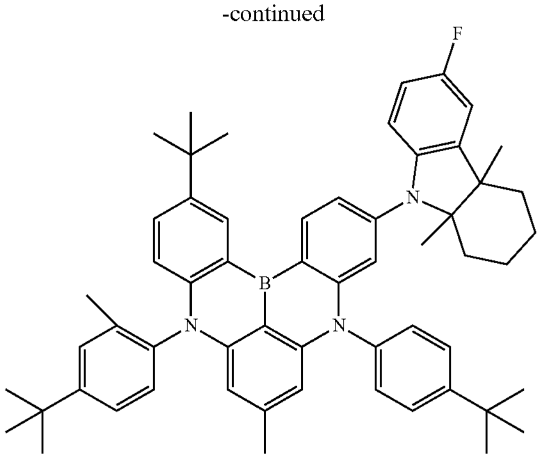
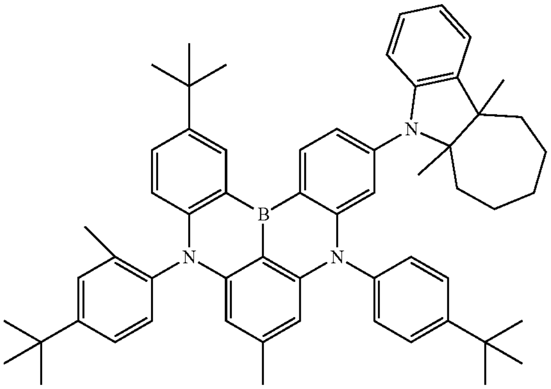
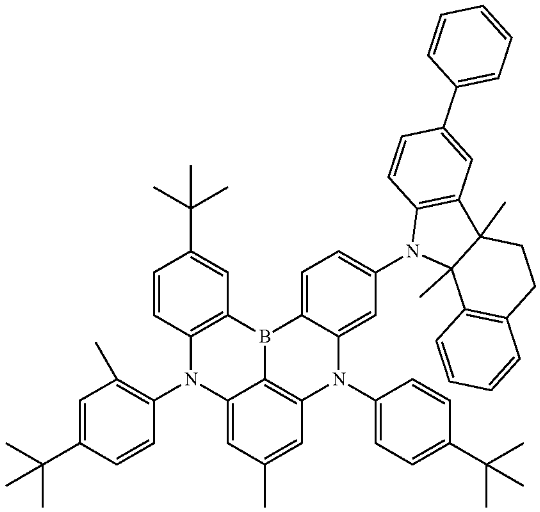
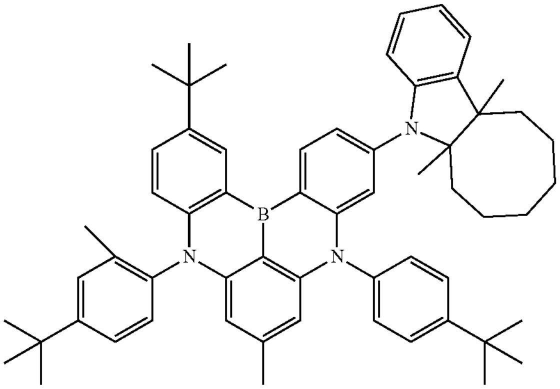
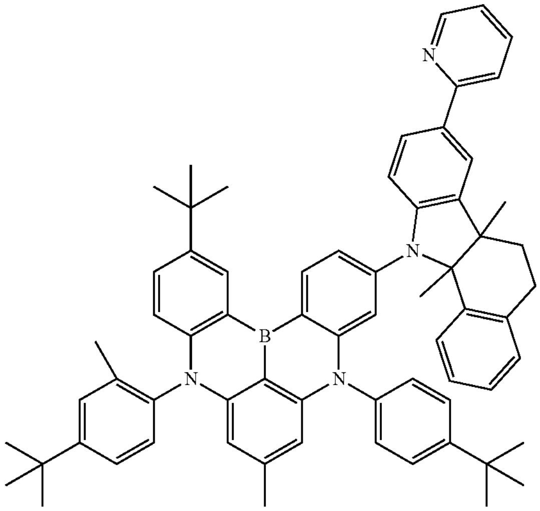
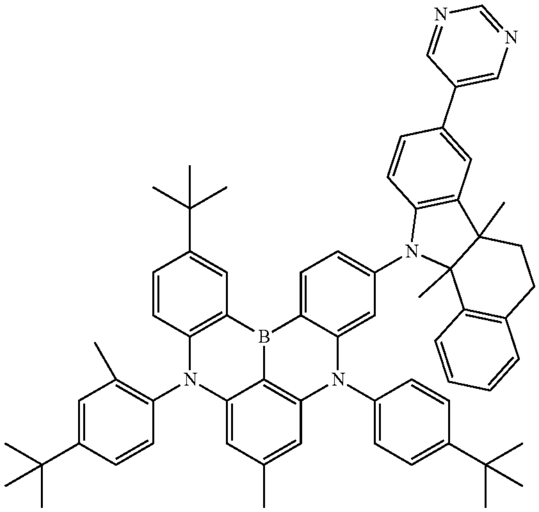
-continued -continued
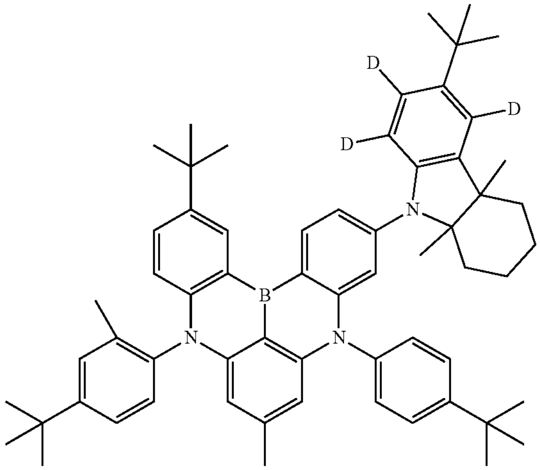
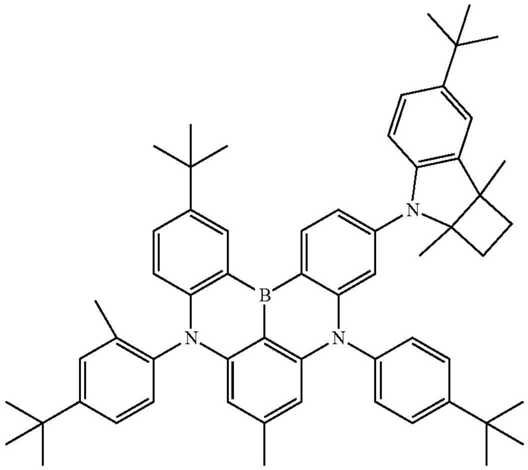
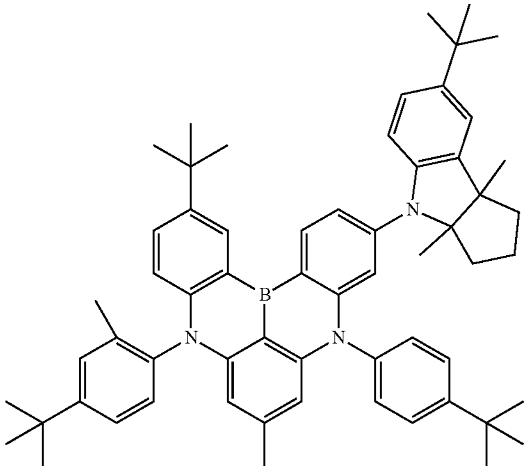
-continued
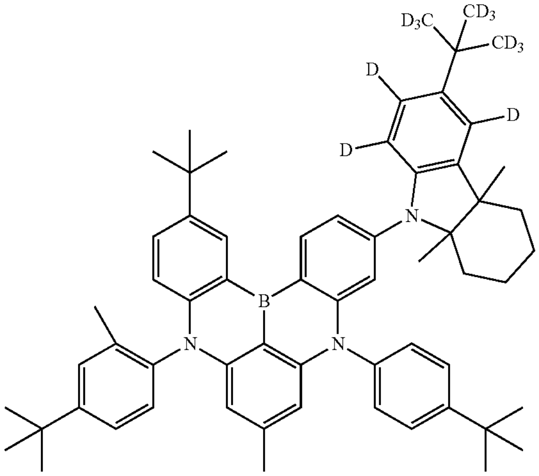
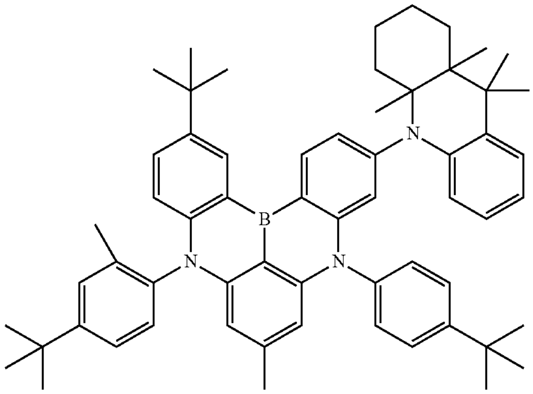
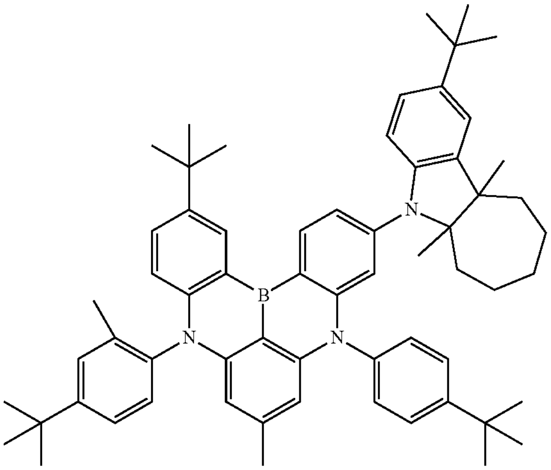

-continued
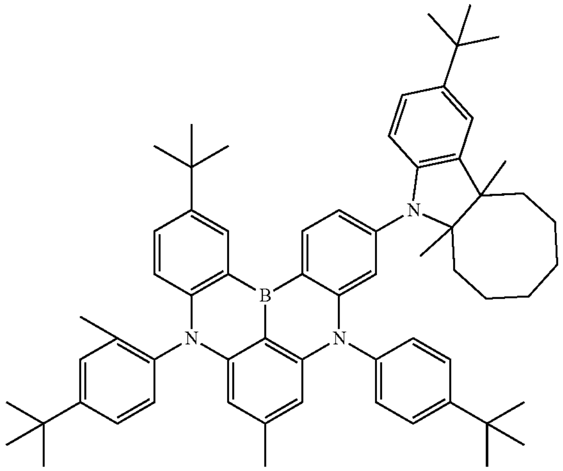
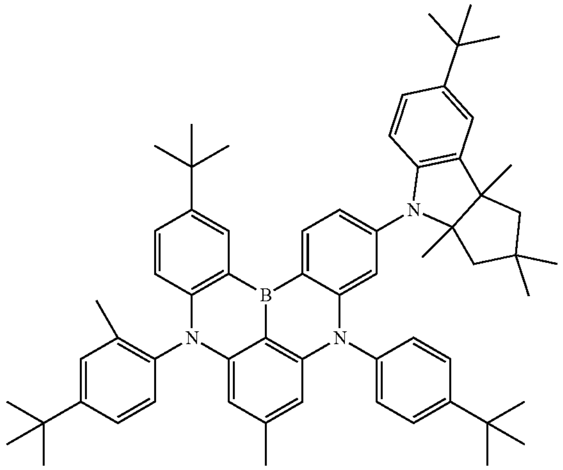
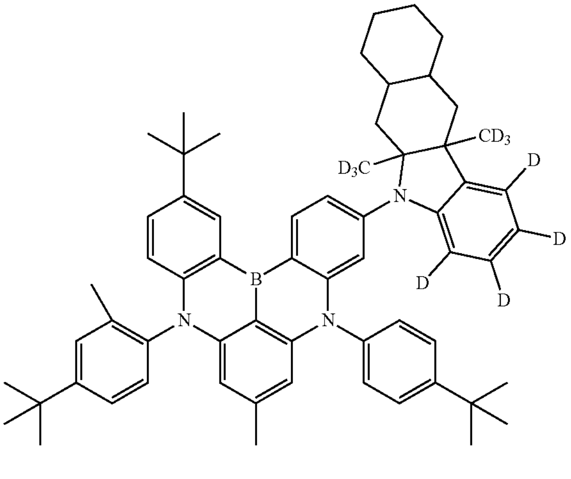
-continued
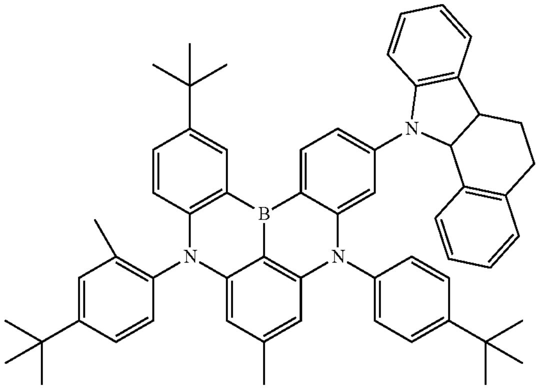
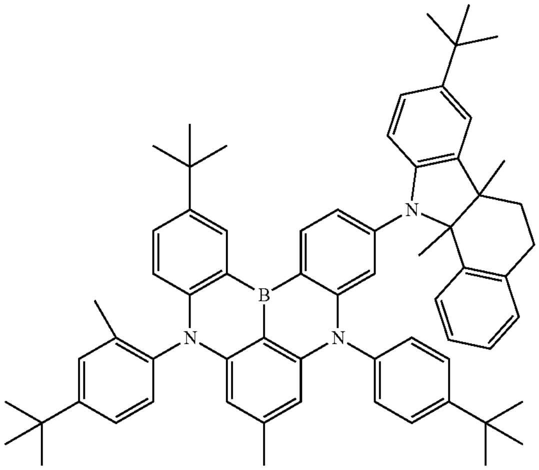
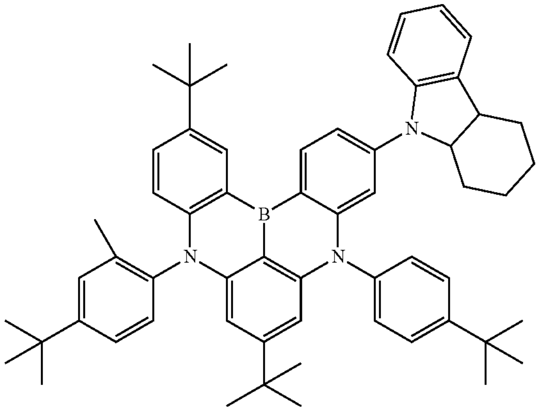

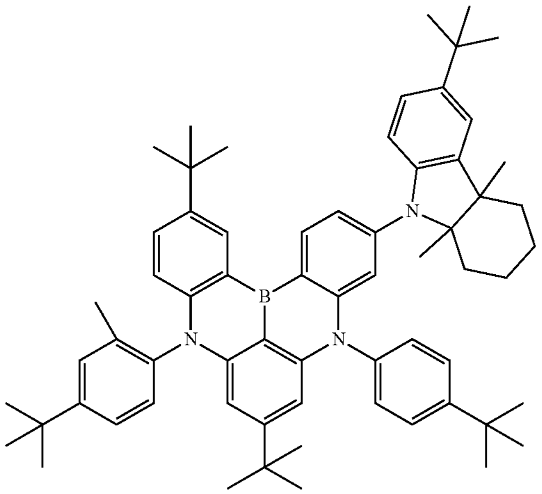
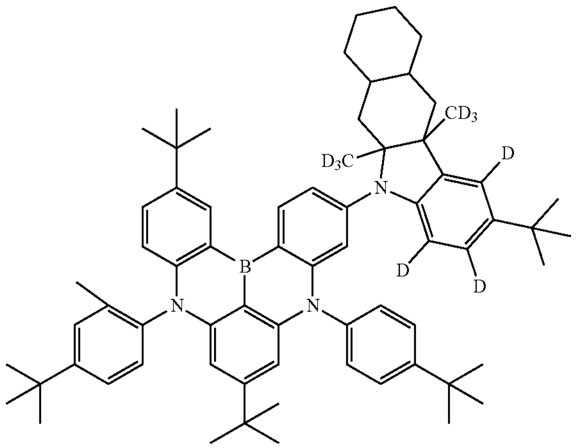
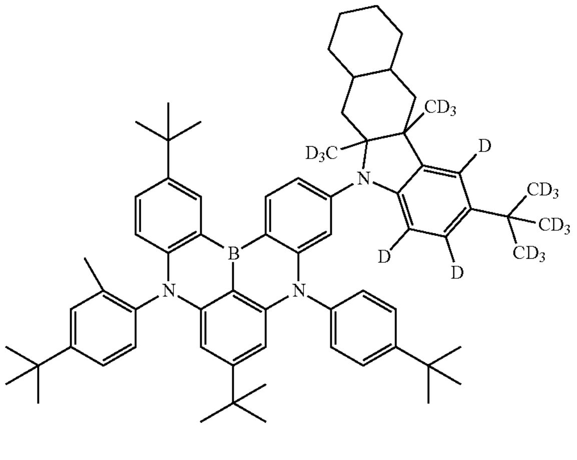
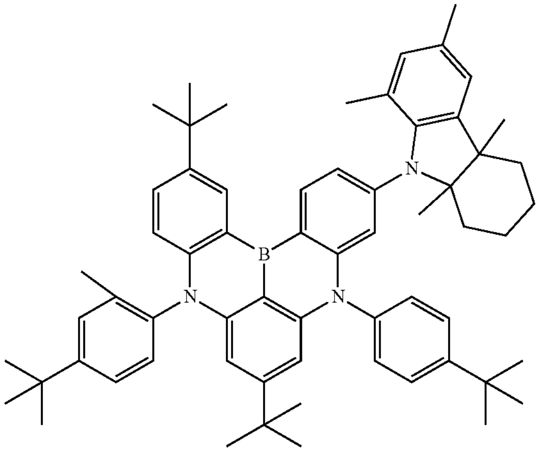
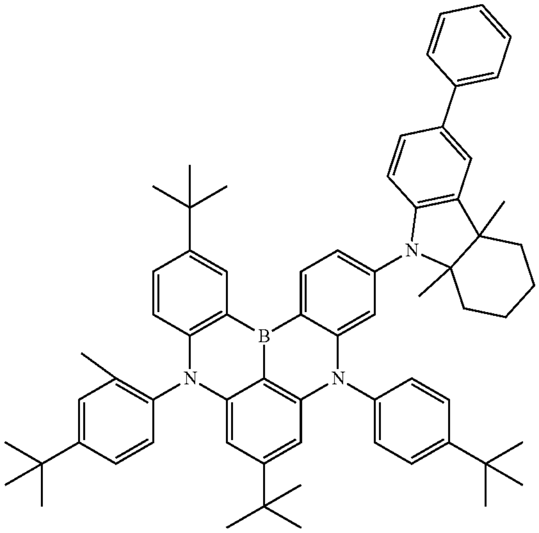
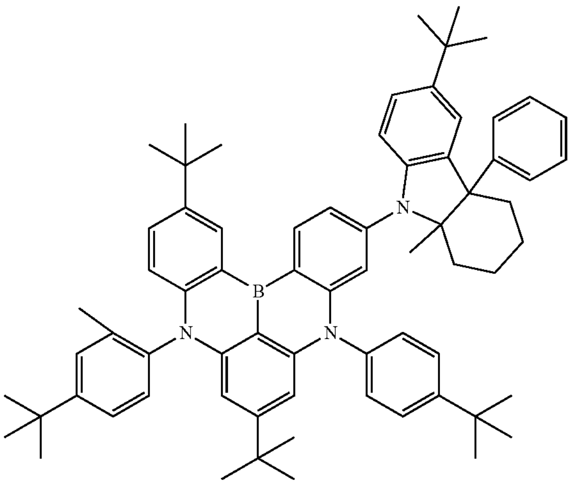

-continued
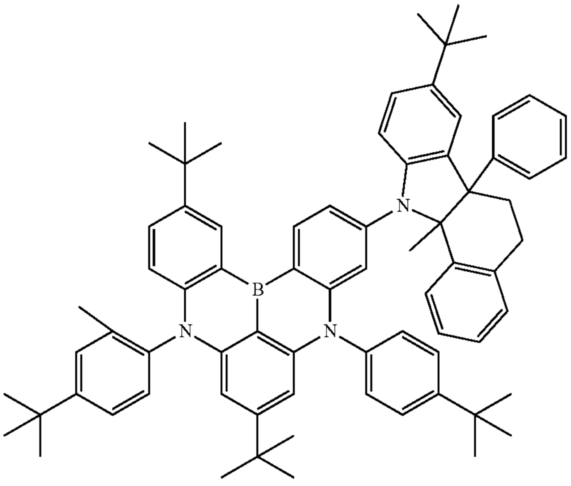
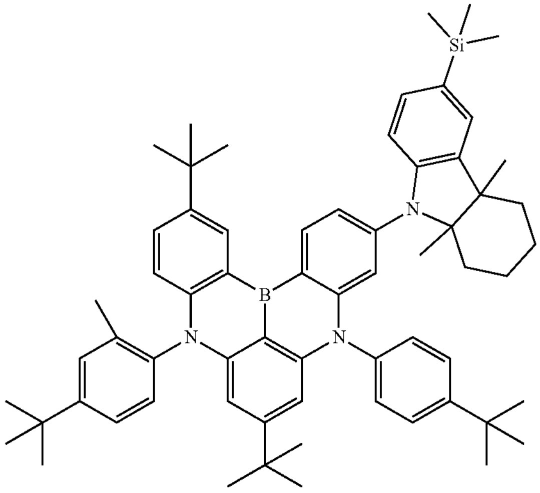
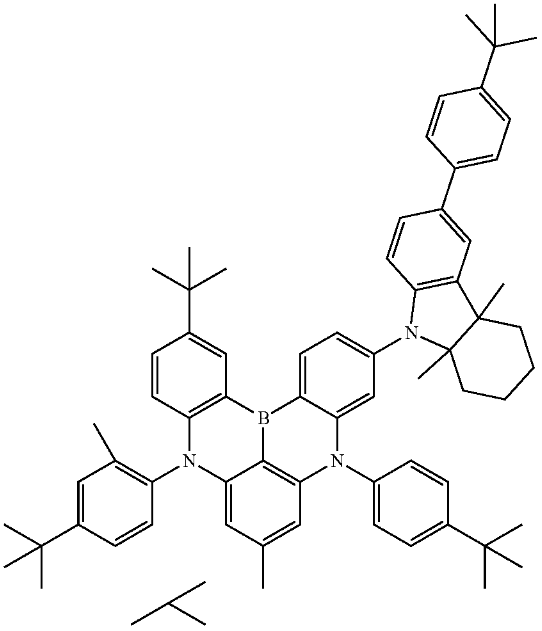
-continued
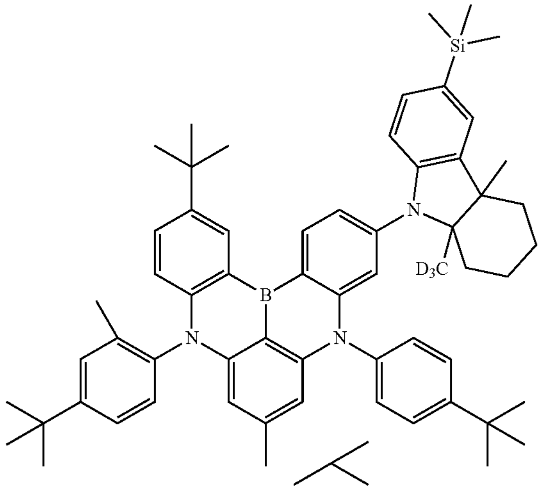
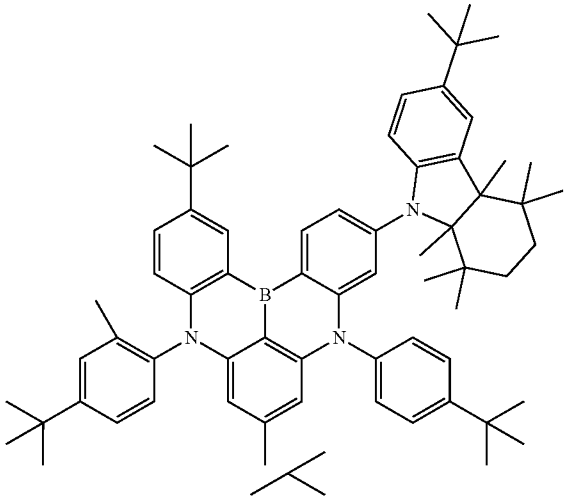
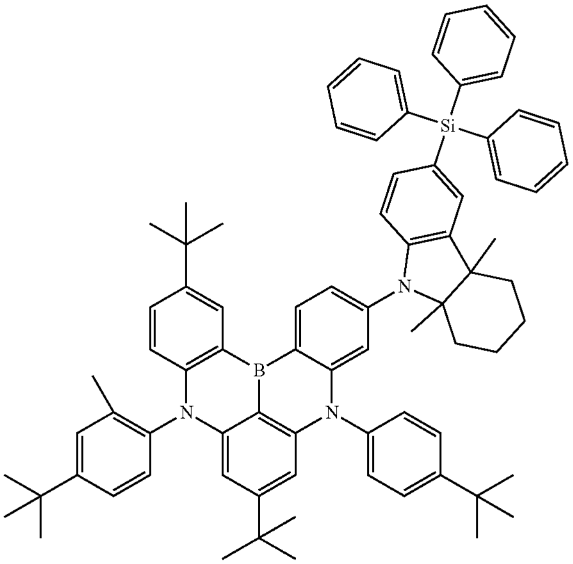

-continued
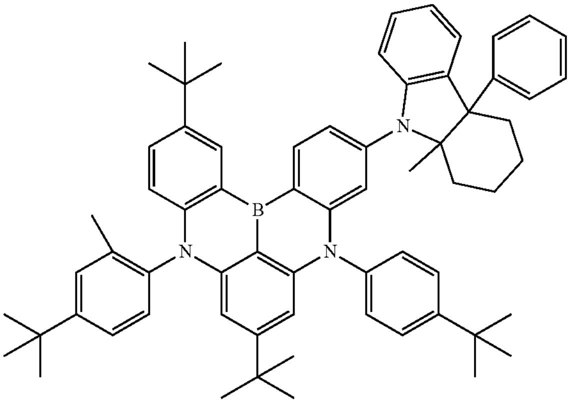
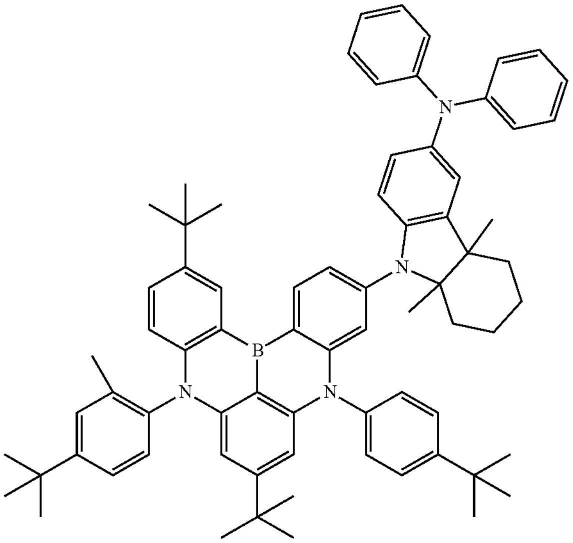
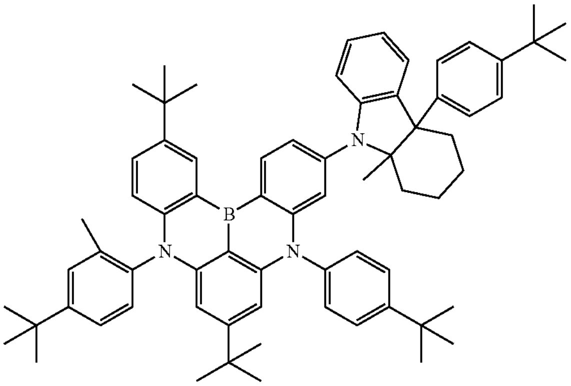
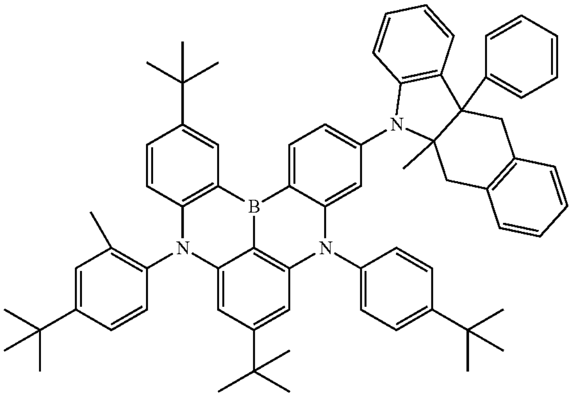
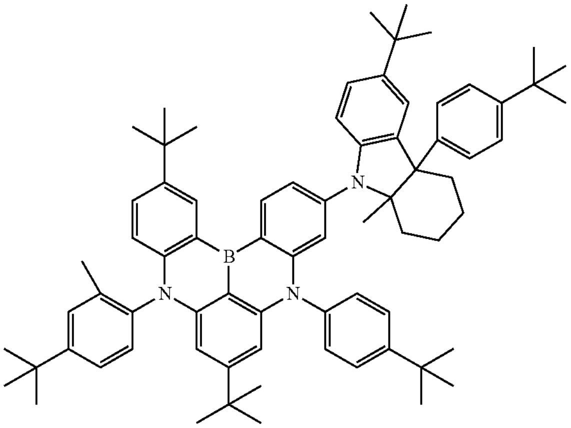
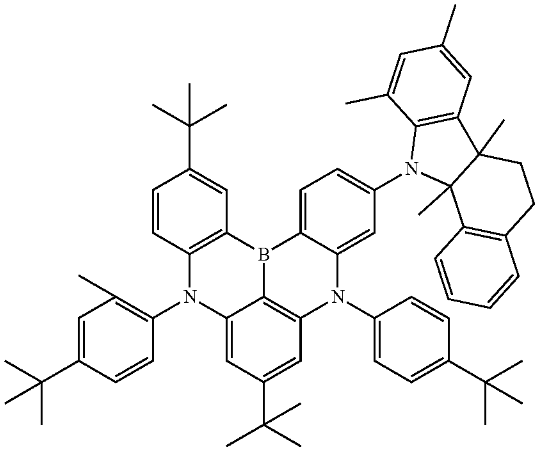
-continued -continued
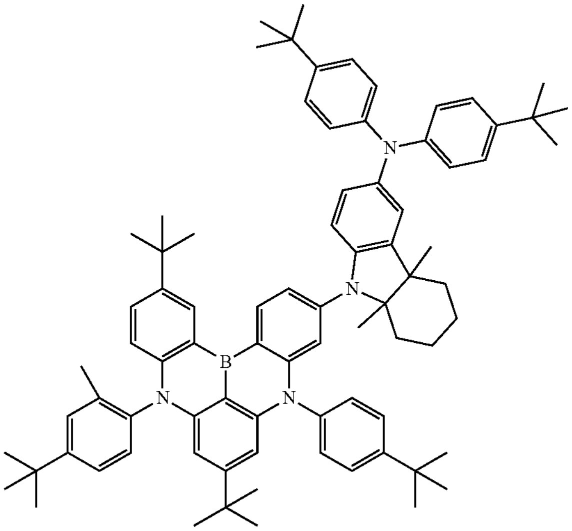
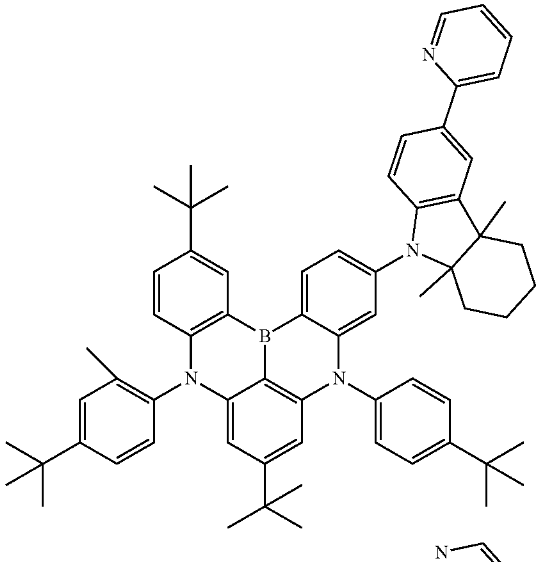
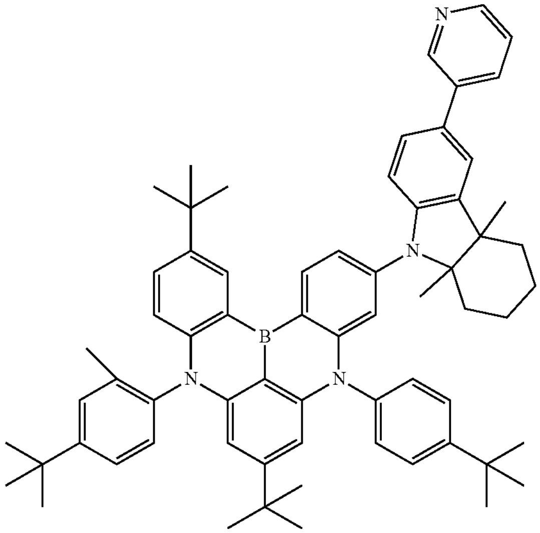
-continued
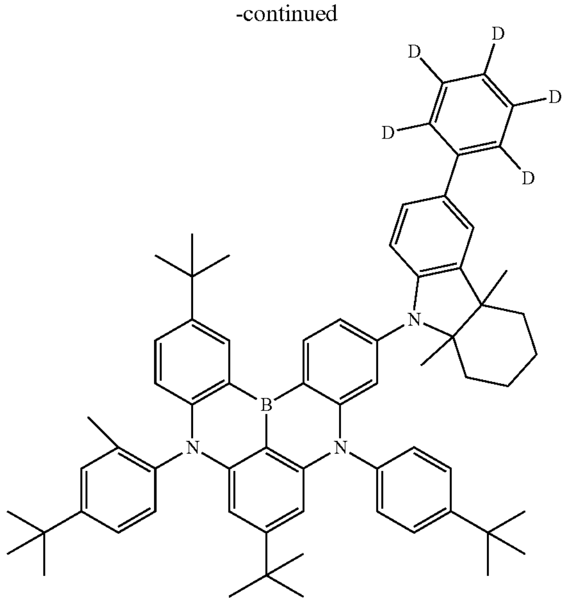
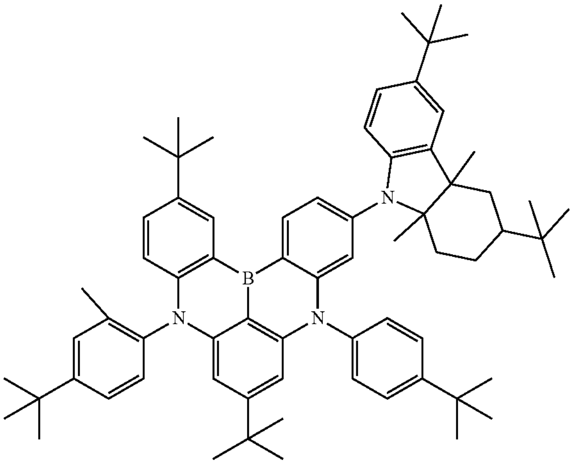
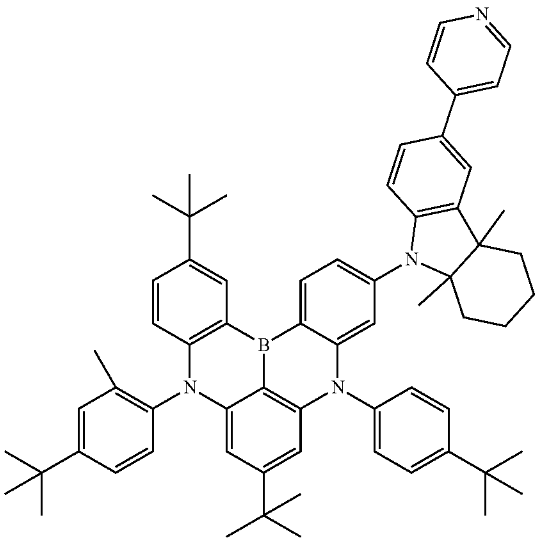

-continued
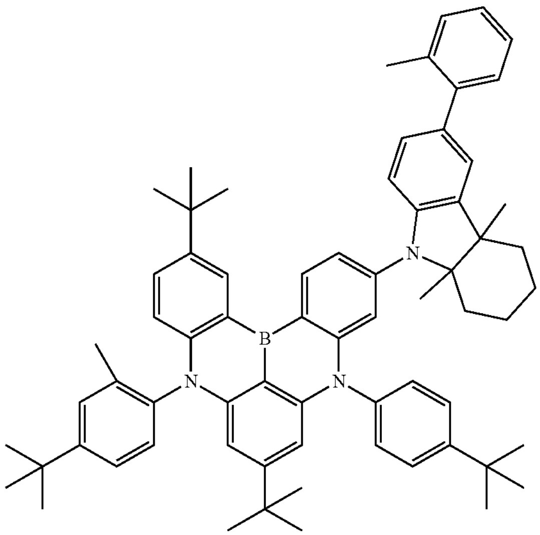
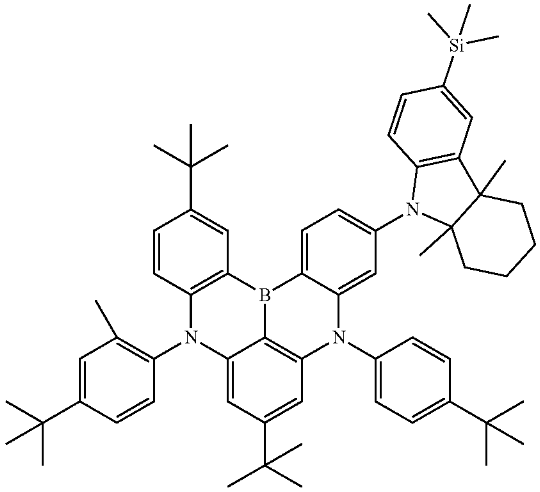
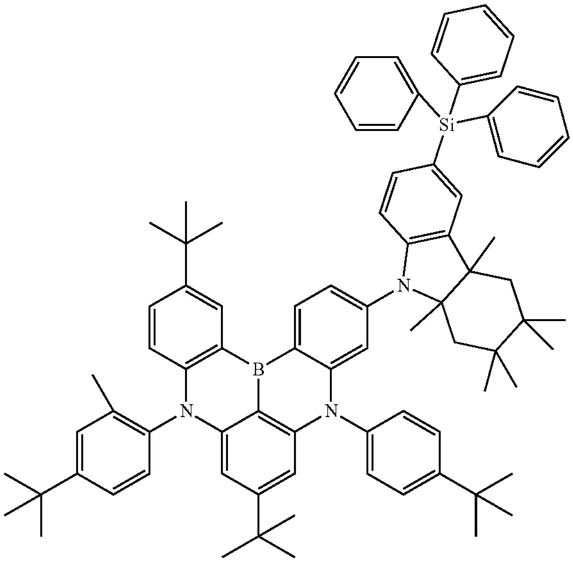
-continued
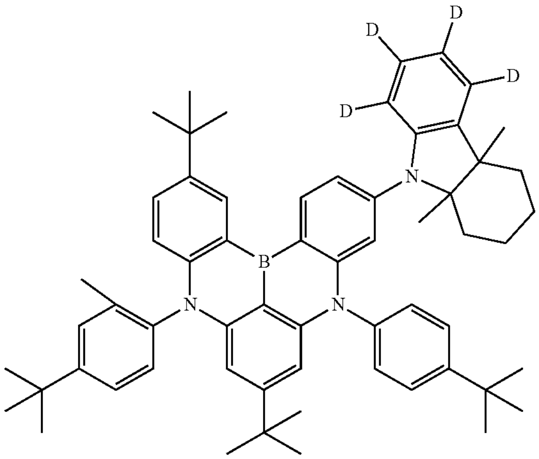
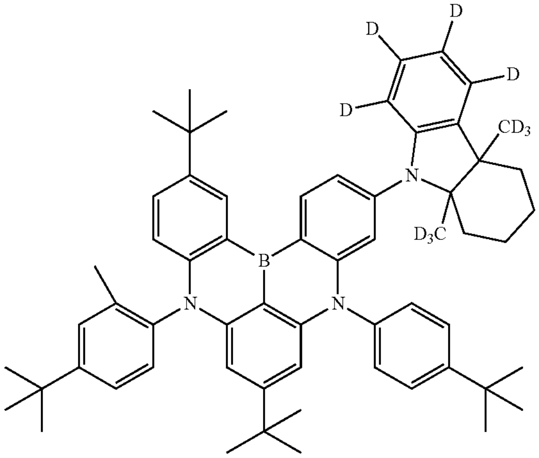
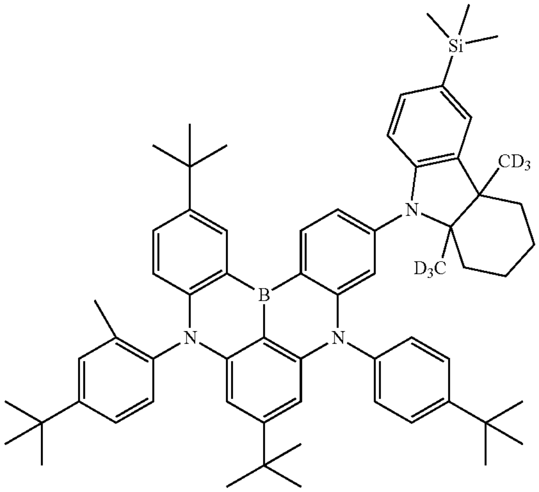

-continued
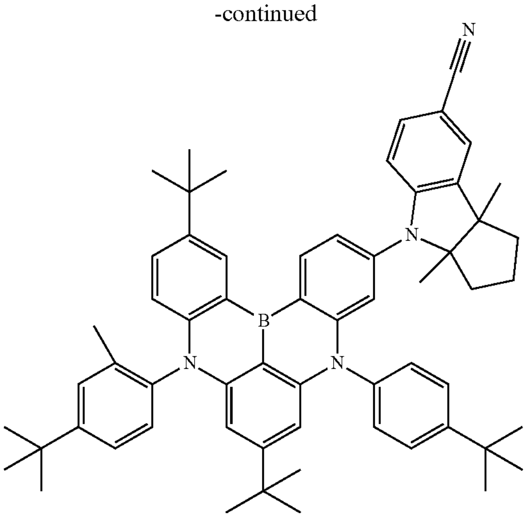
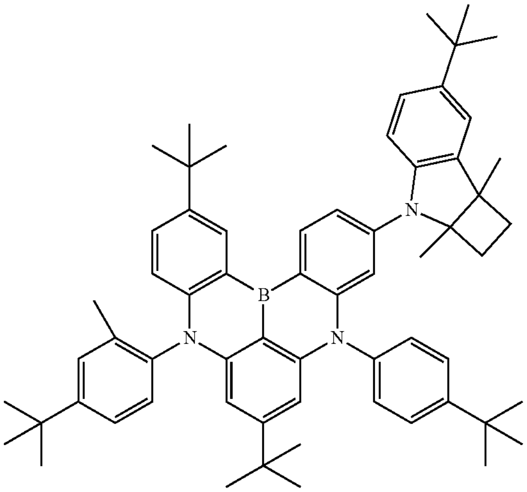
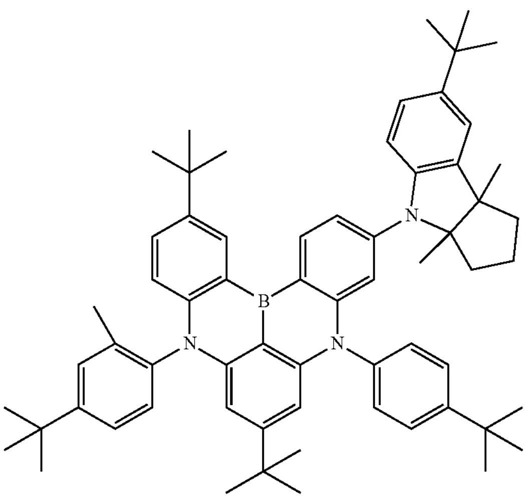
-continued
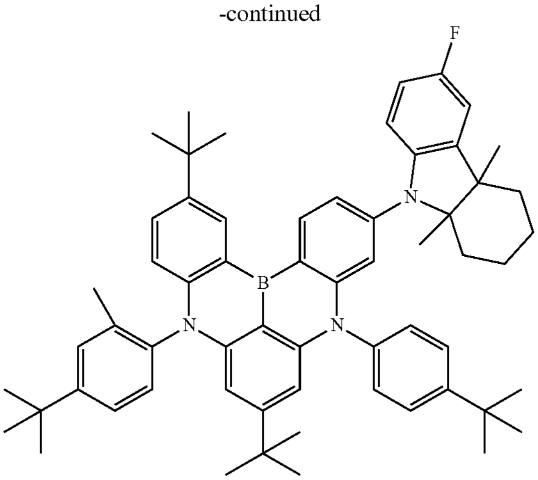
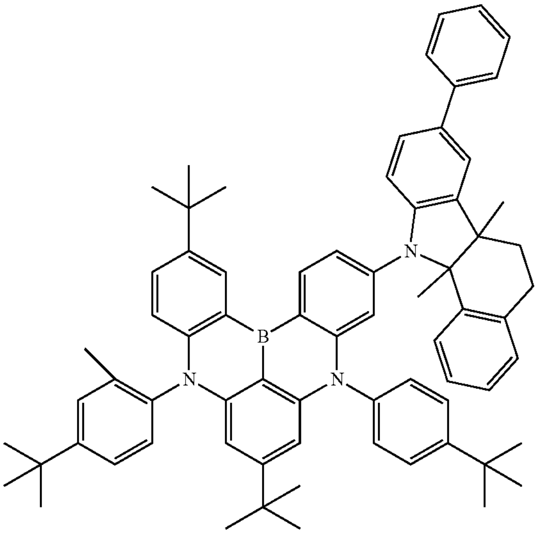
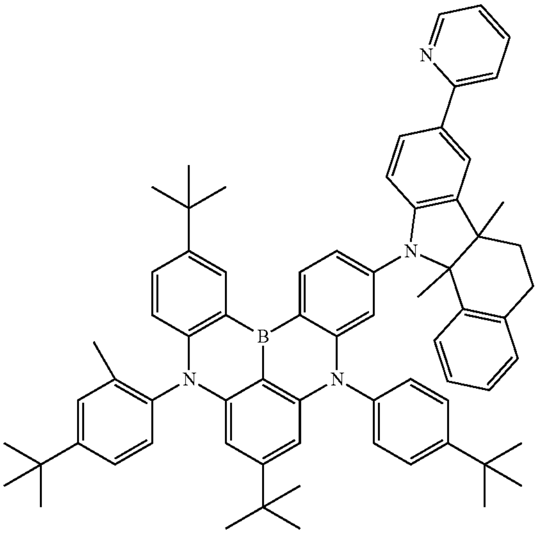

-continued
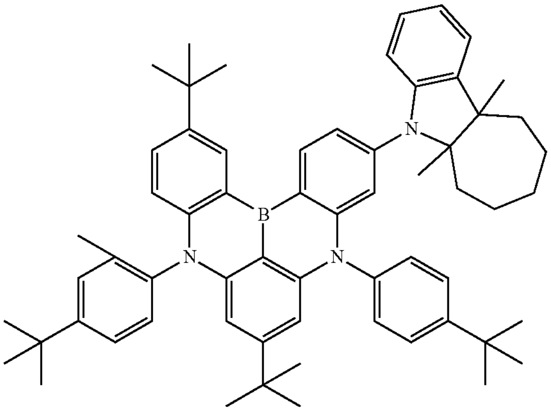
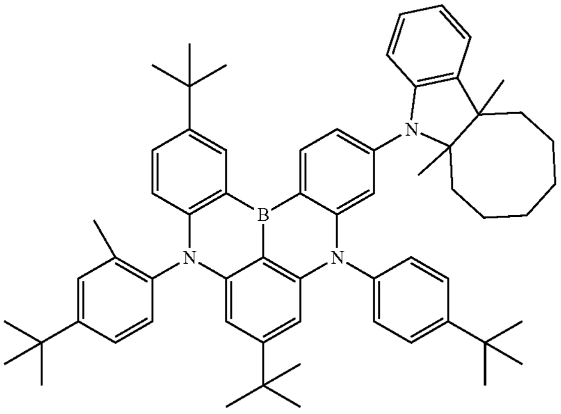
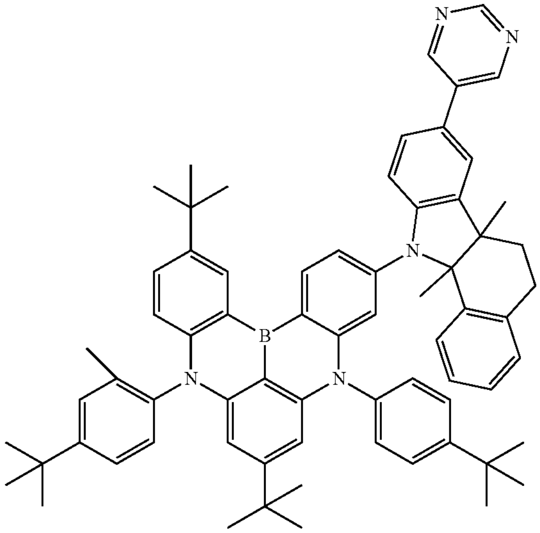
-continued
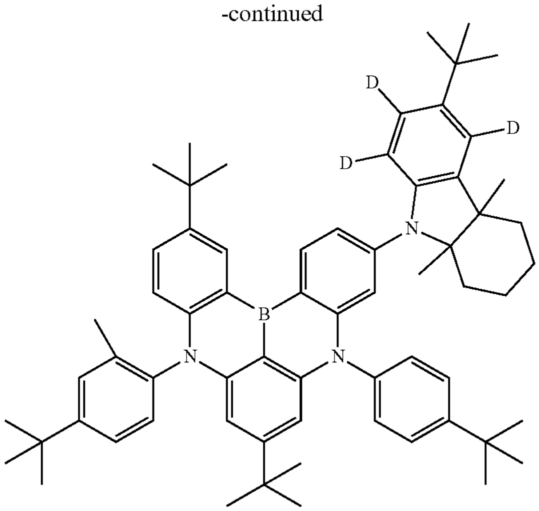
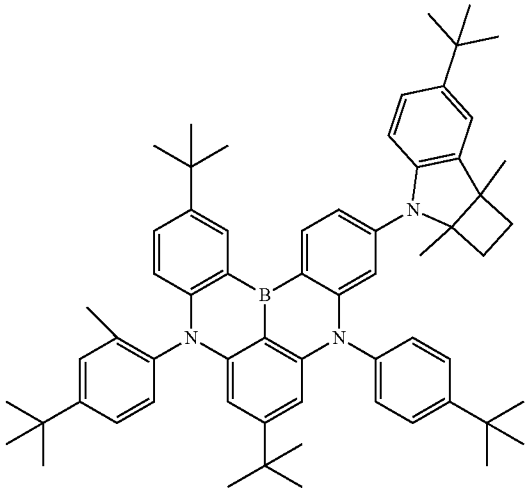
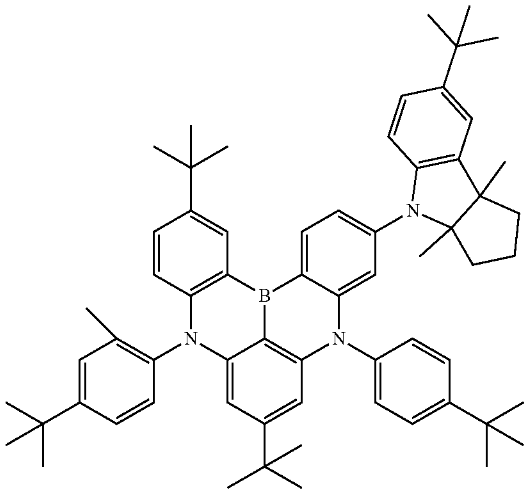

-continued
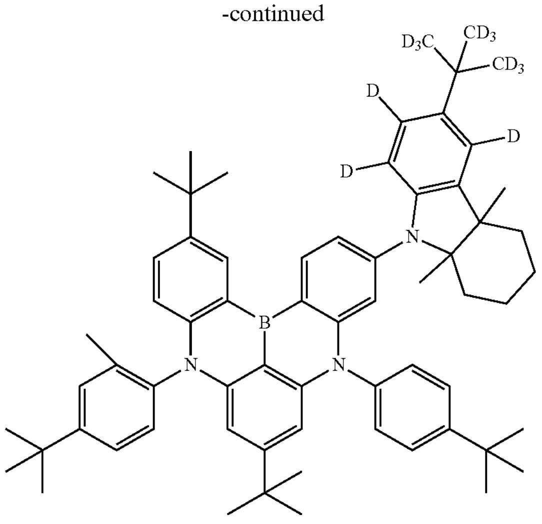
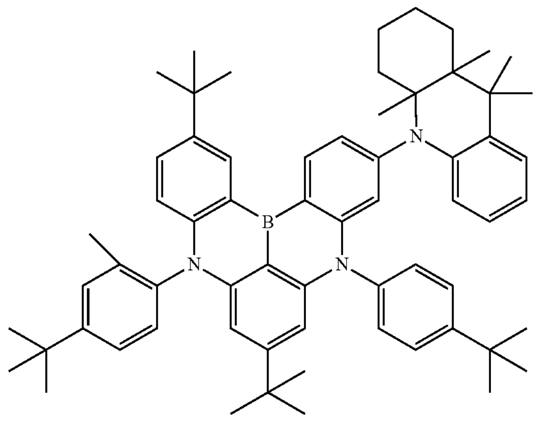
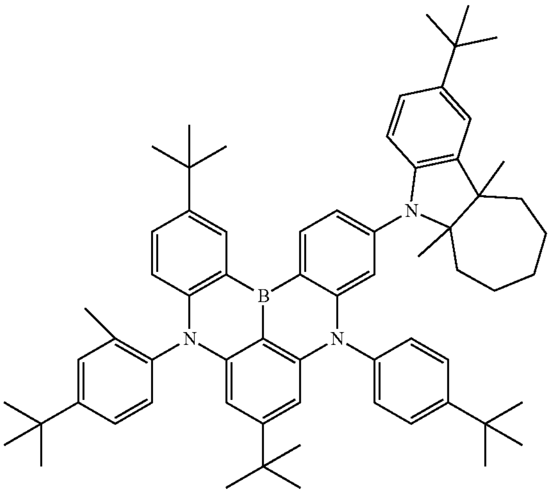
-continued
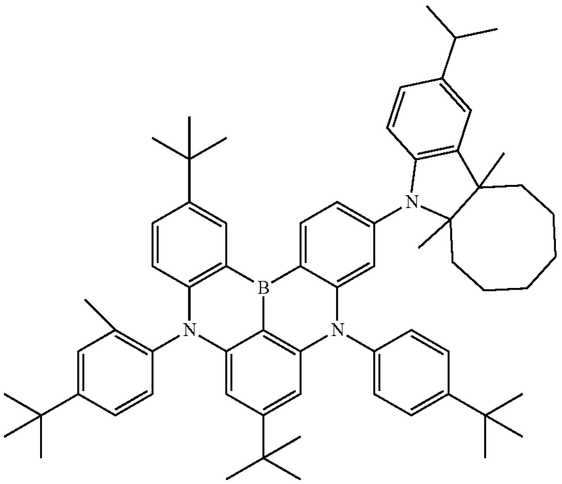
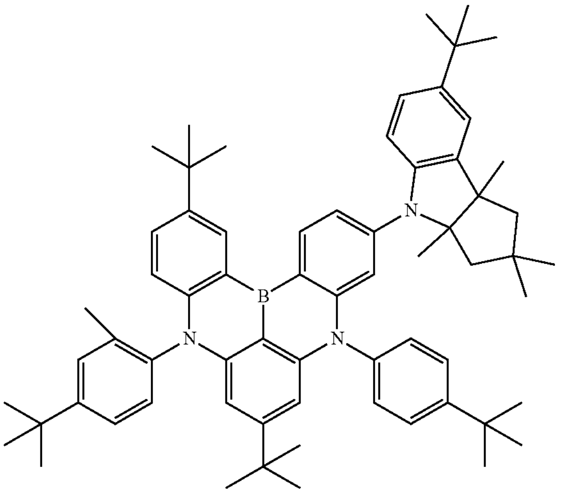
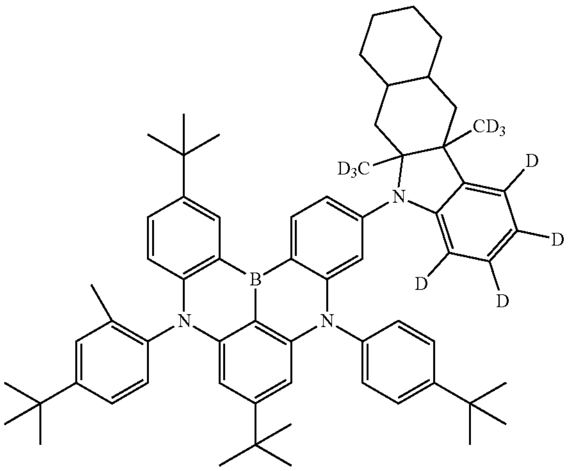

-continued
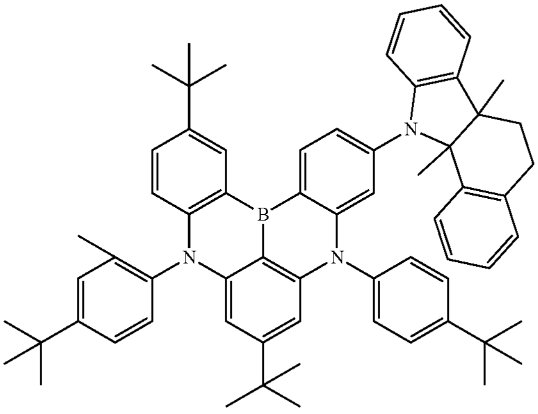
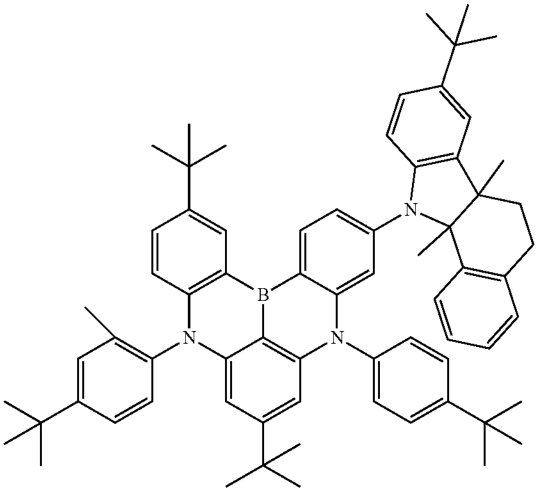
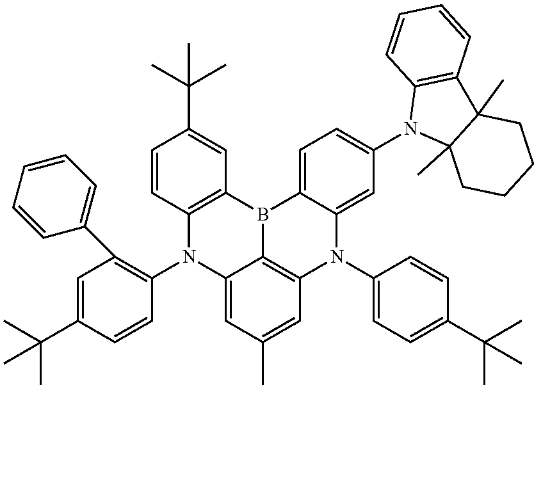
-continued
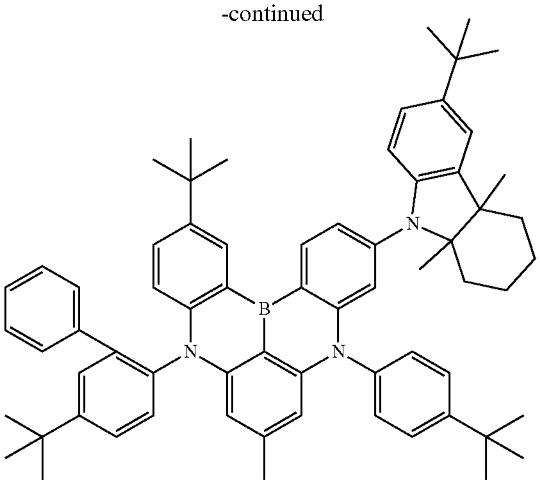
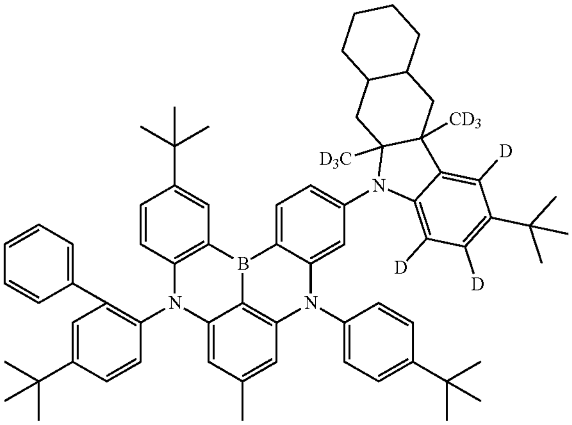
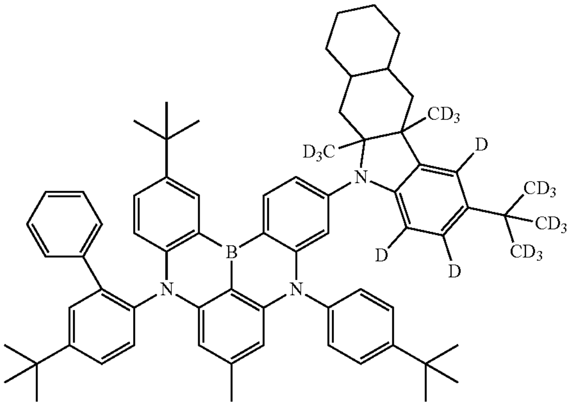
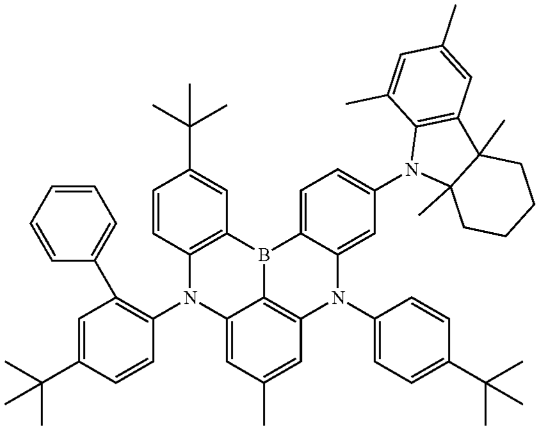

-continued
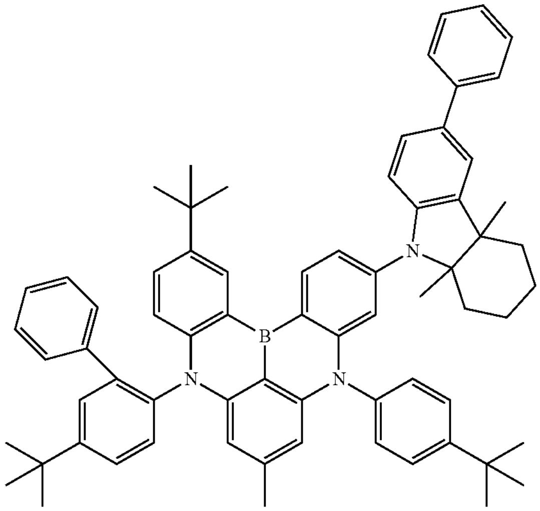
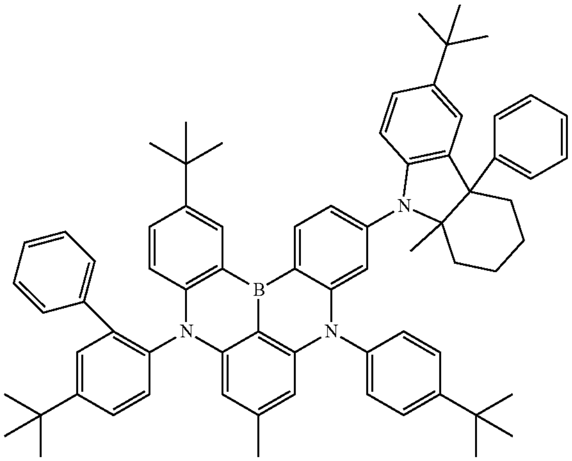
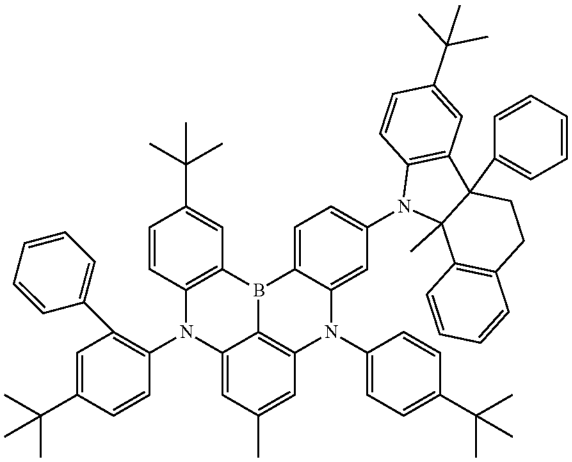
-continued
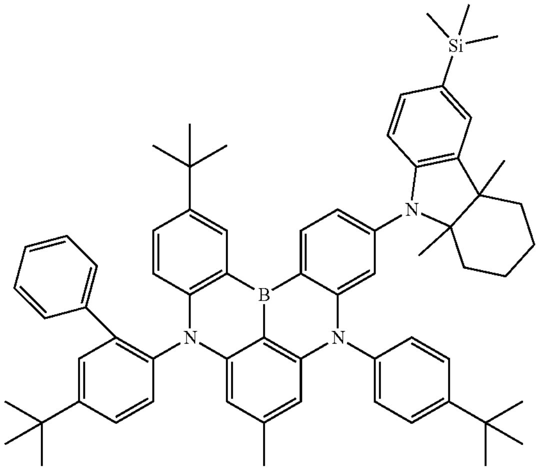
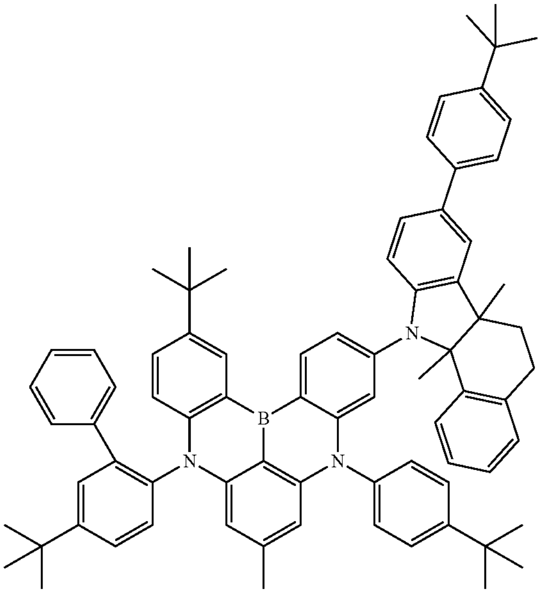
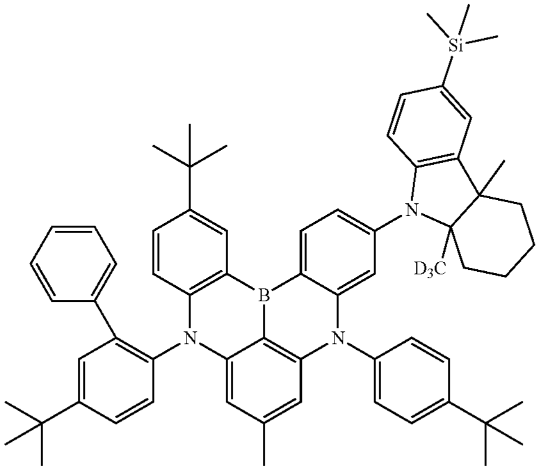

-continued
-continued
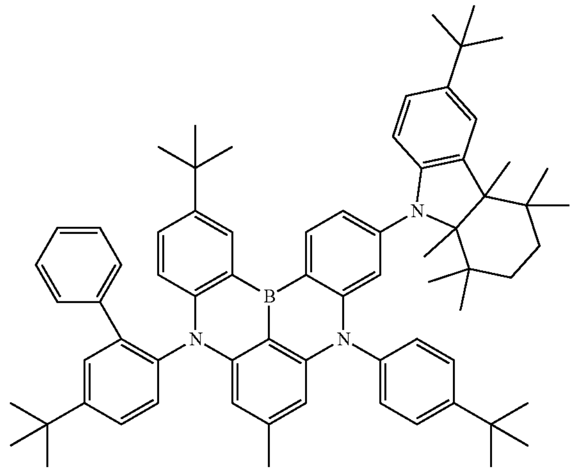
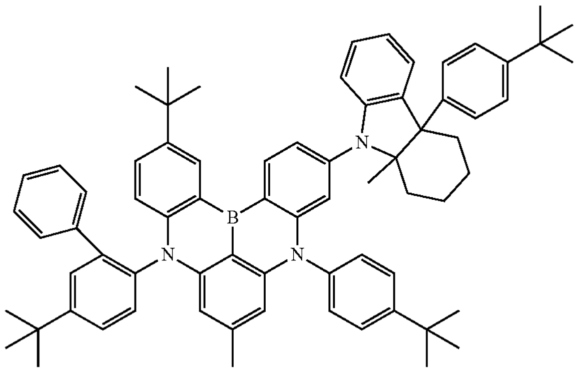
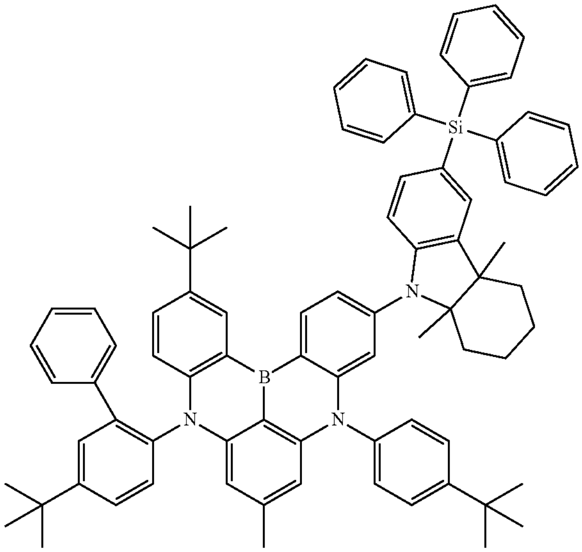
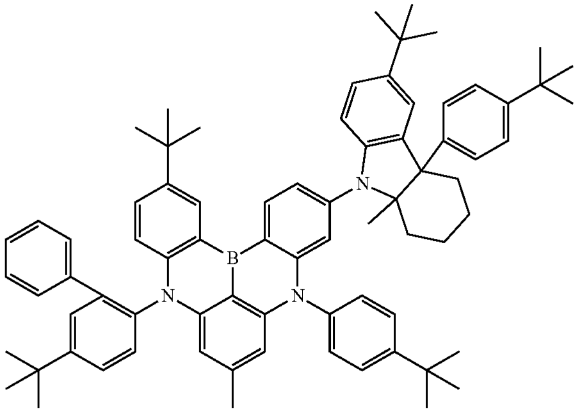
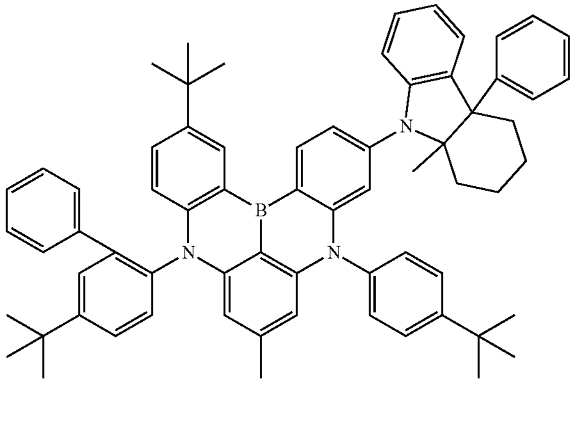
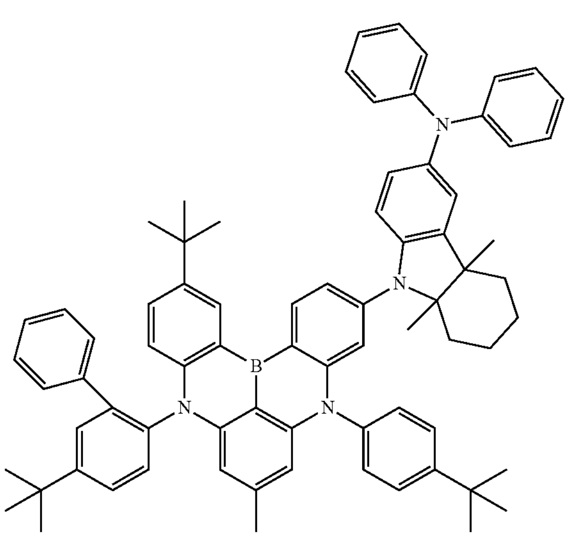

-continued
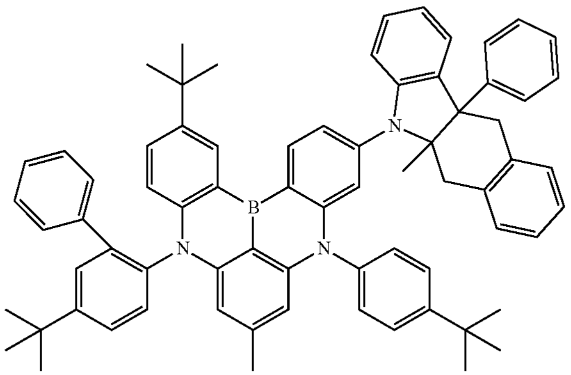
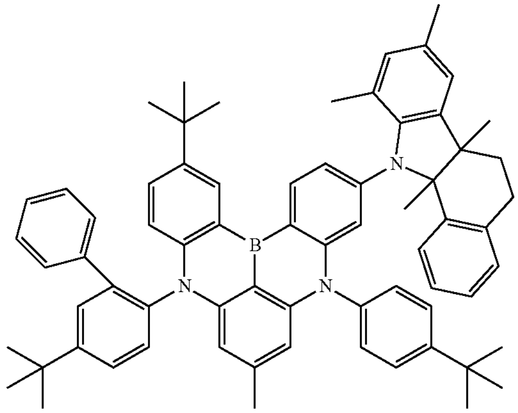
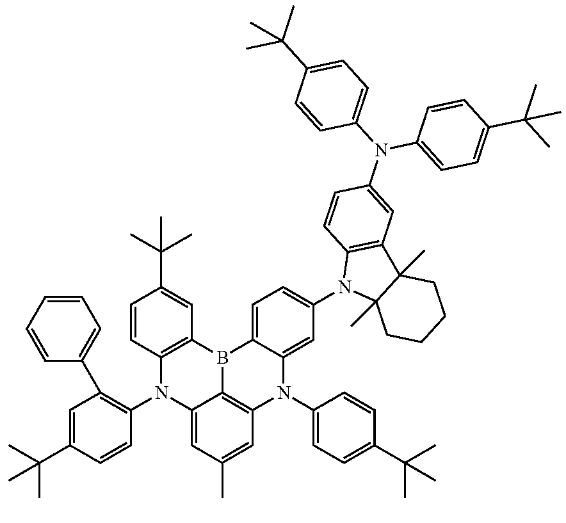
-continued
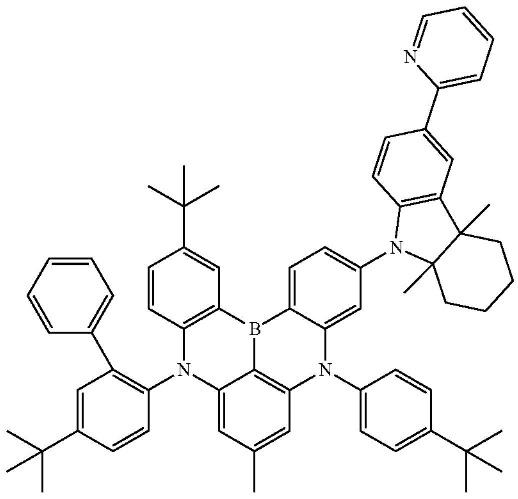
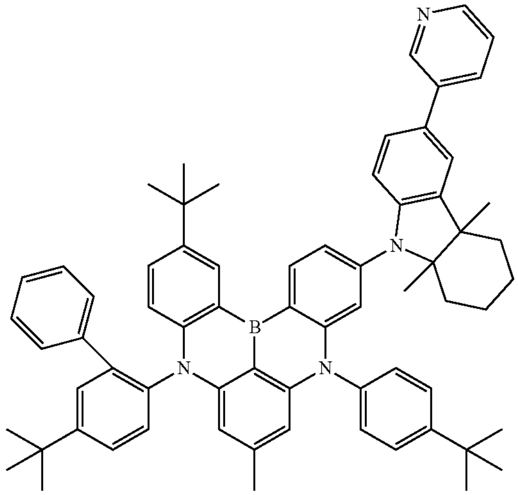
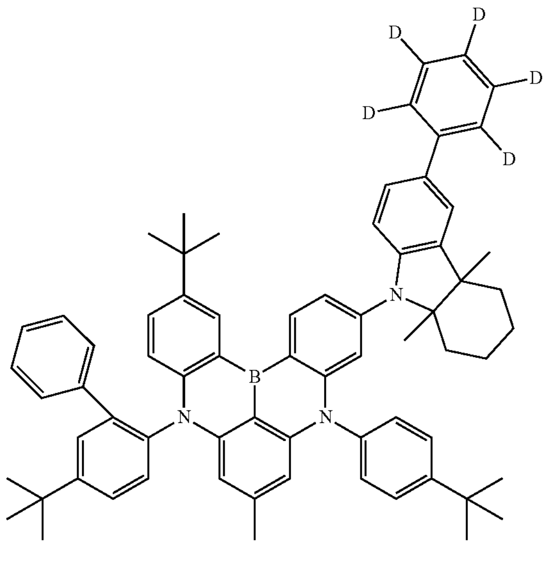

-continued
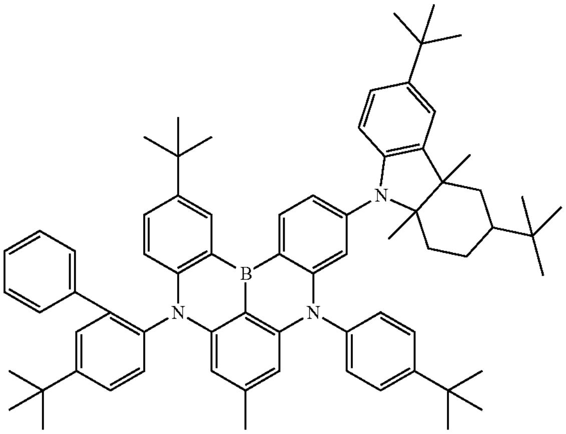
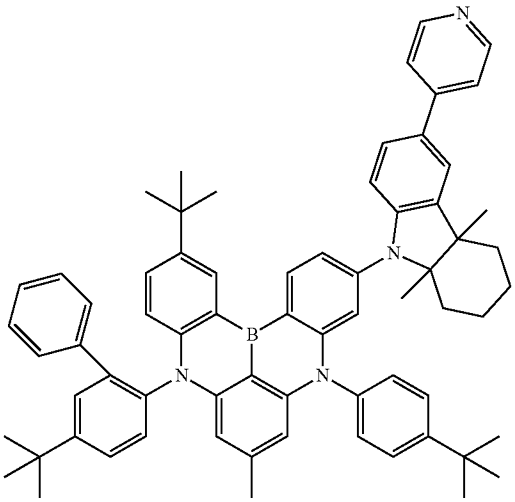
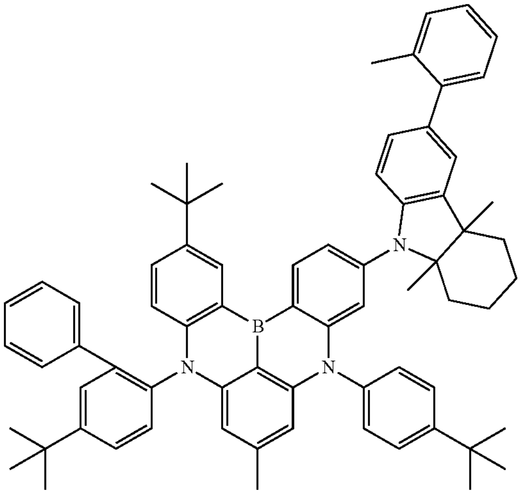
-continued
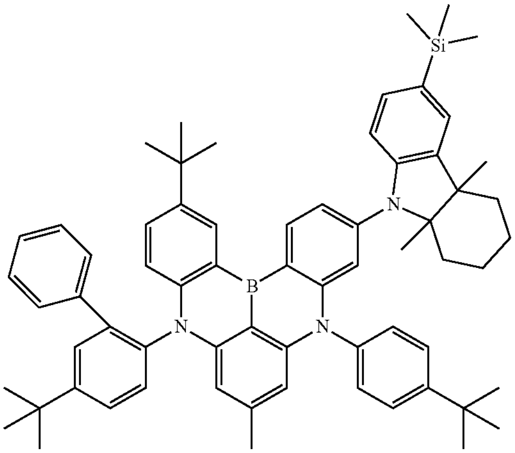
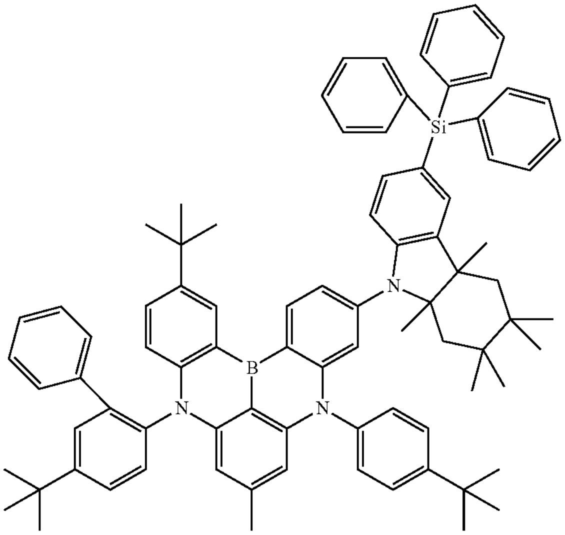
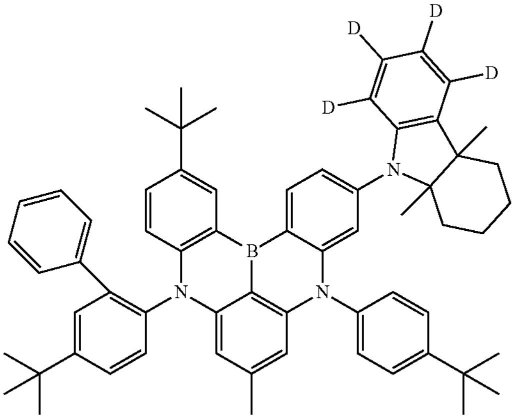

-continued
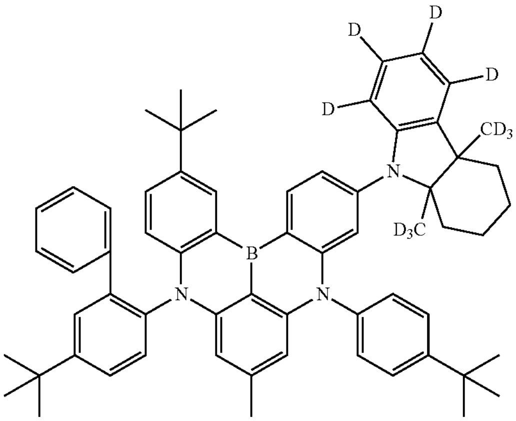
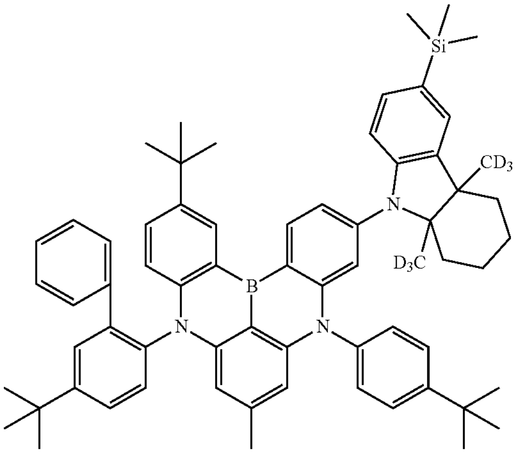
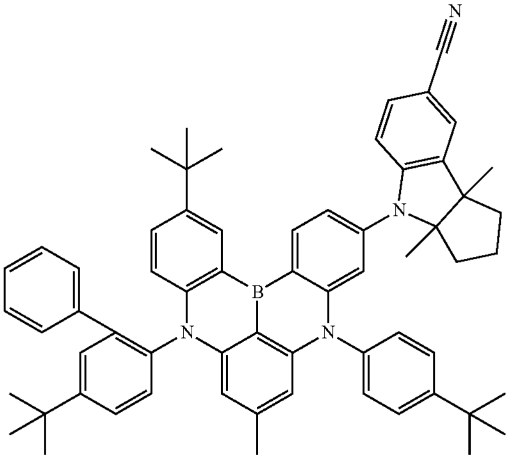
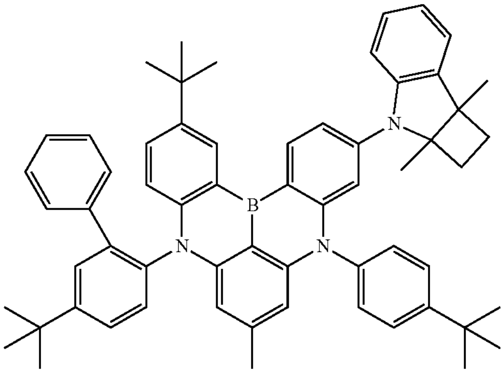
-continued
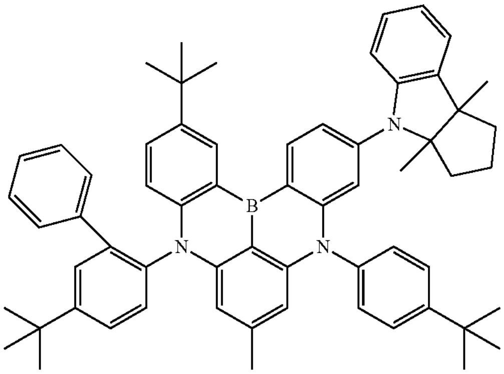
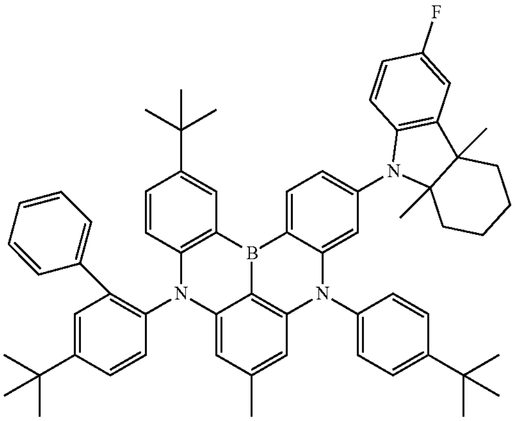
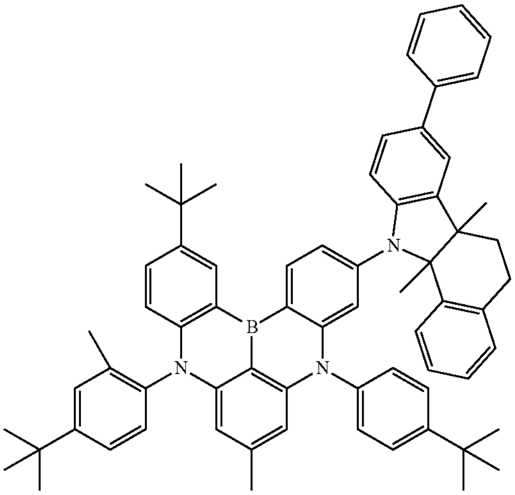

-continued
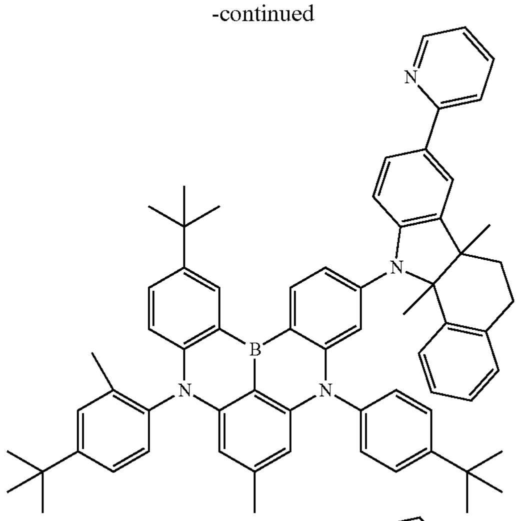
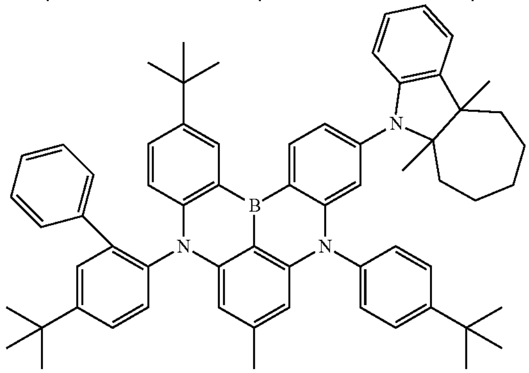
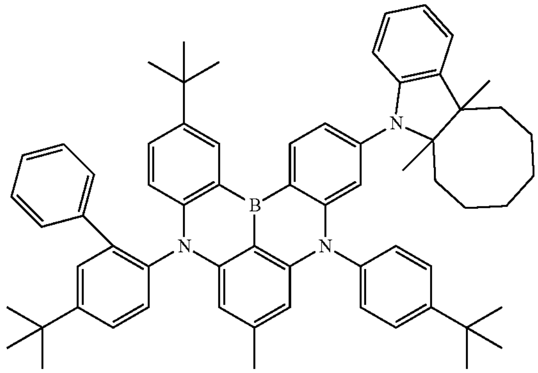
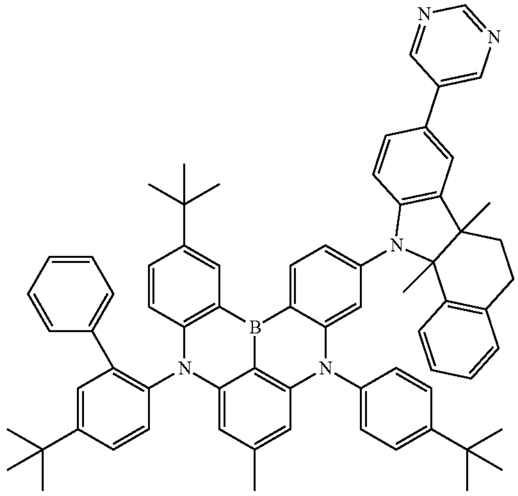
-continued
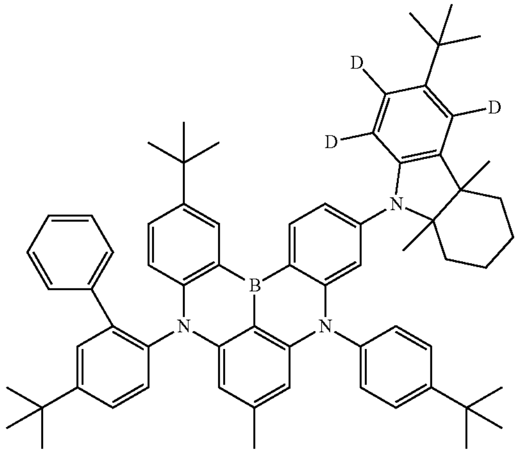
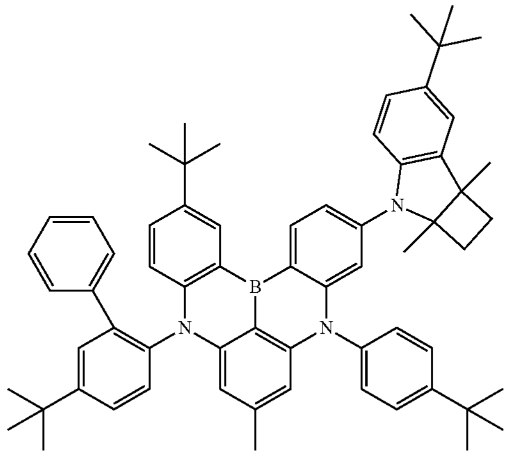
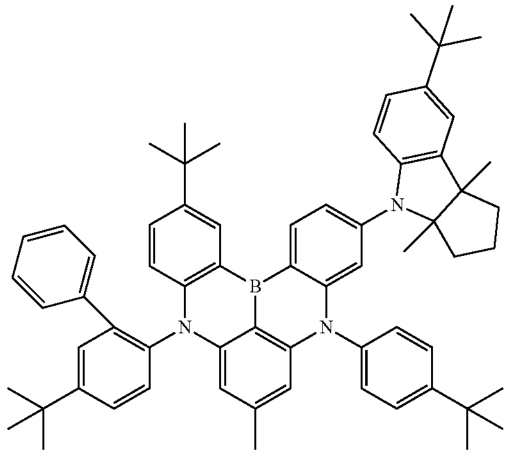

-continued
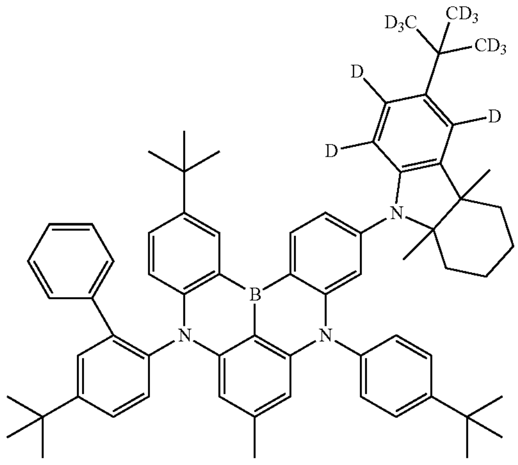
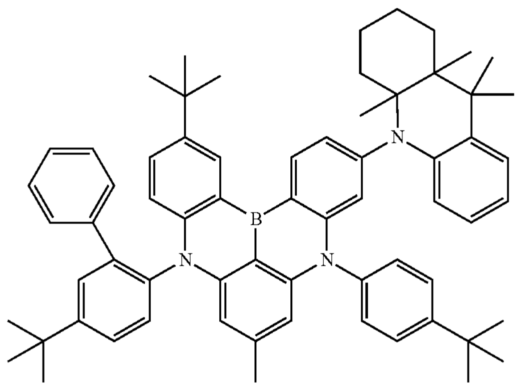
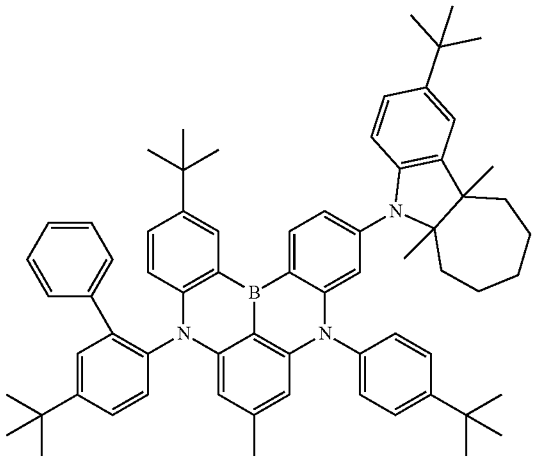
-continued
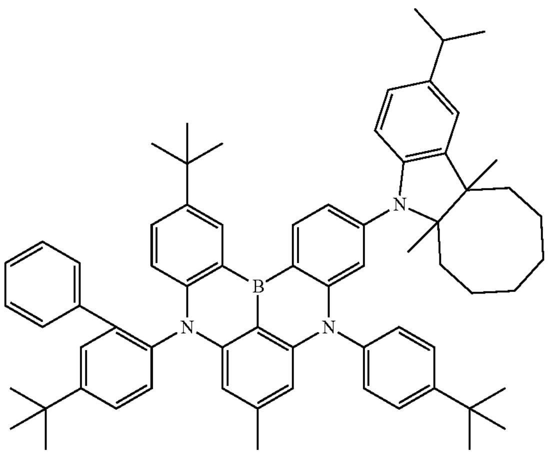
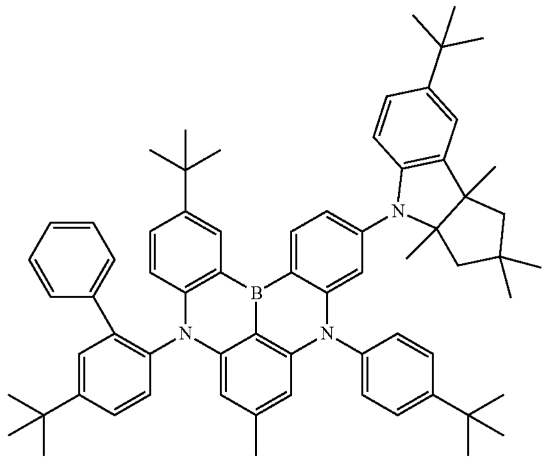
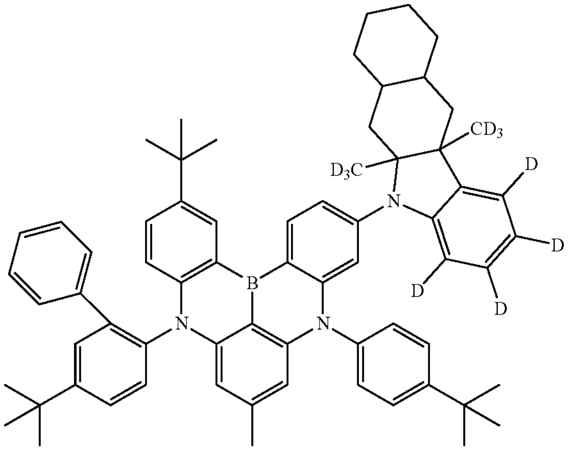

-continued
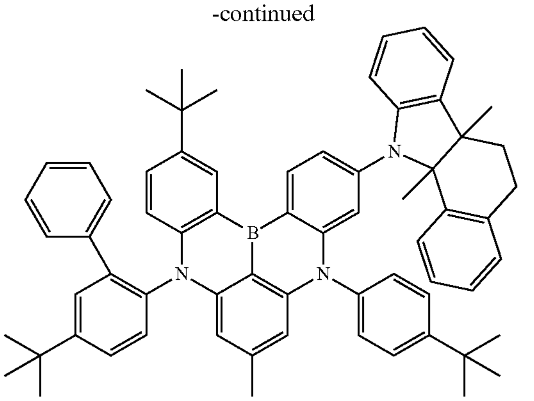
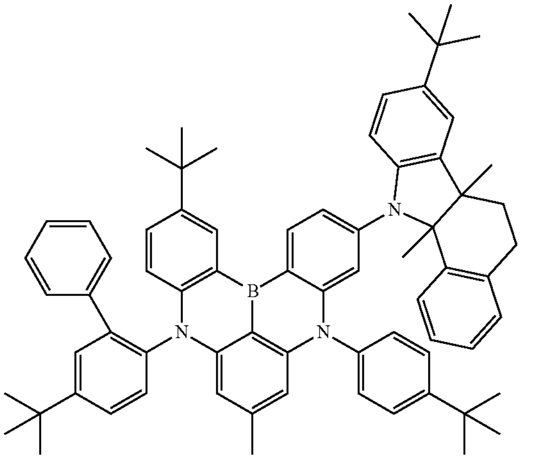
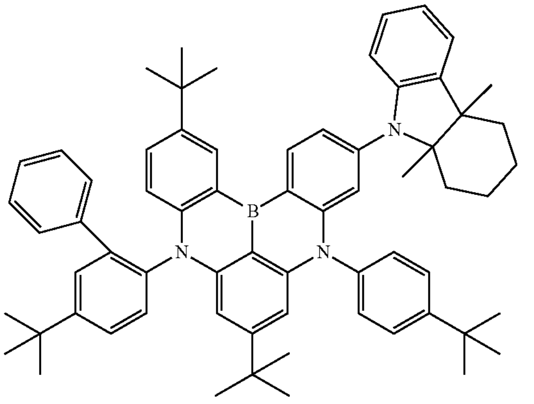
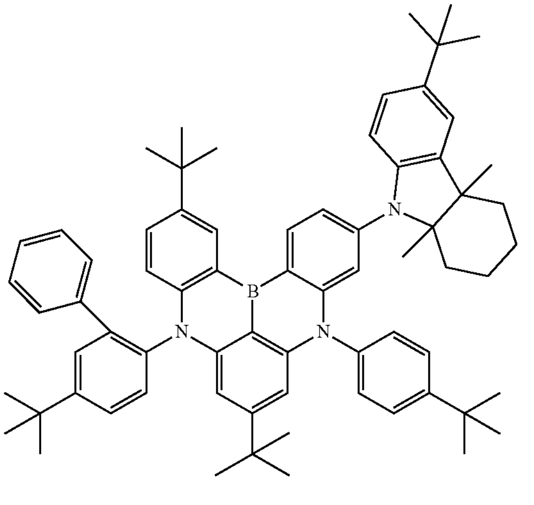
-continued
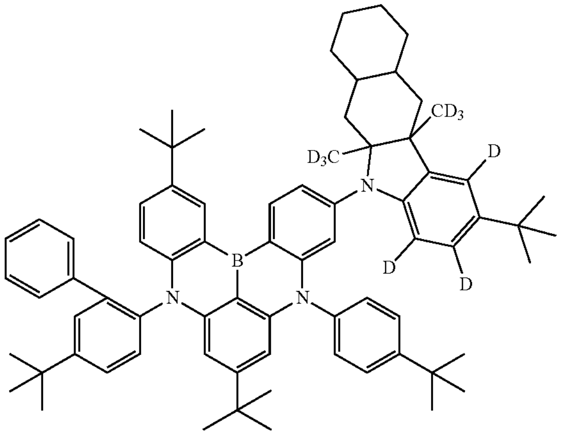
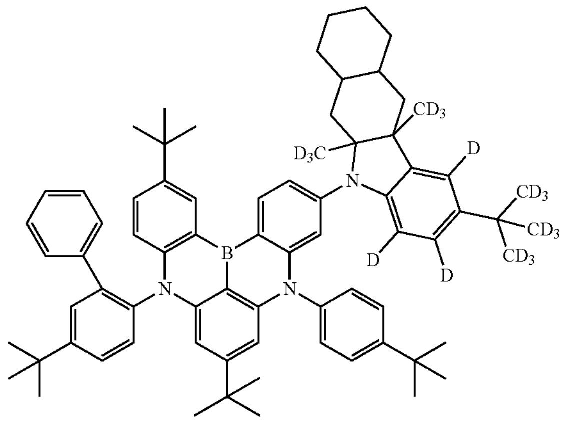
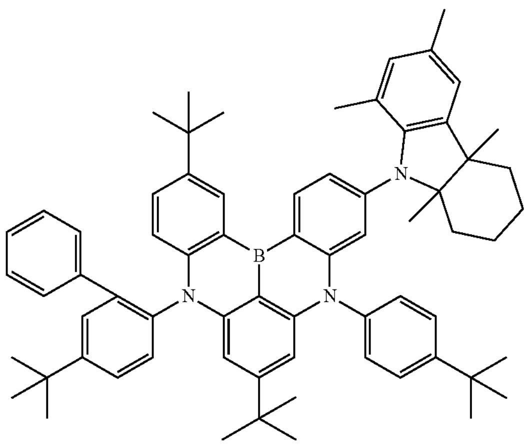

-continued
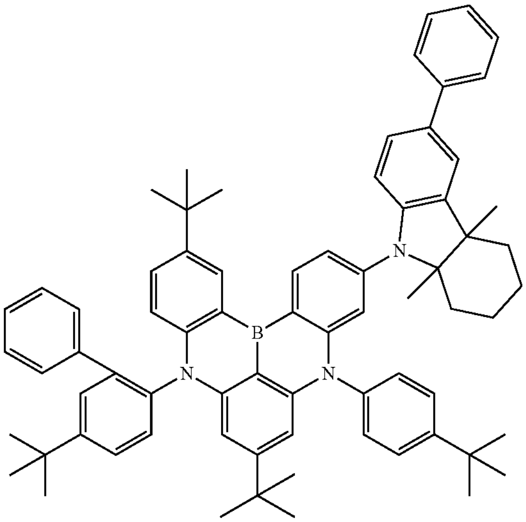
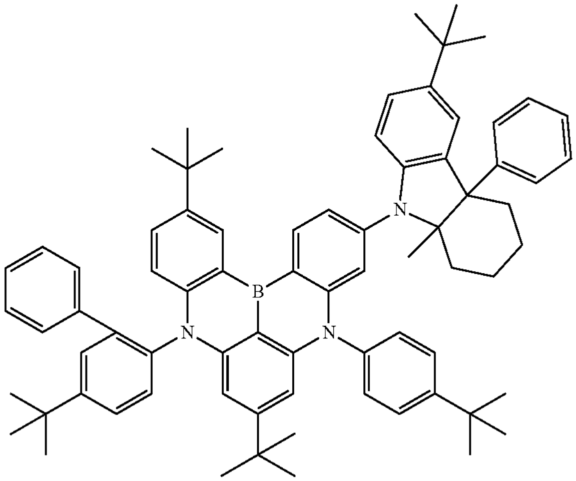
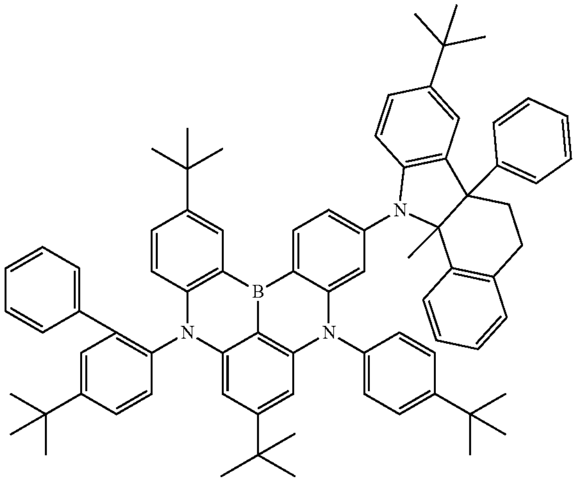
-continued
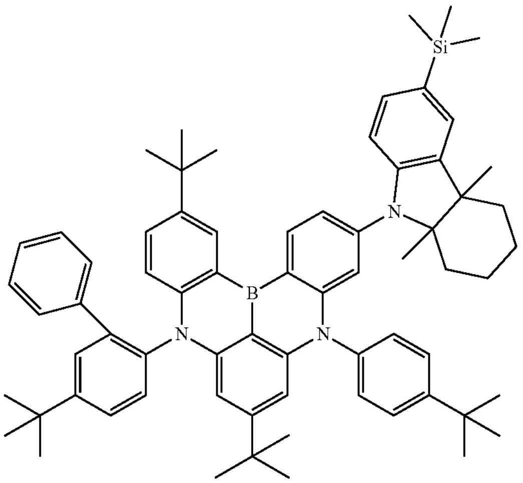
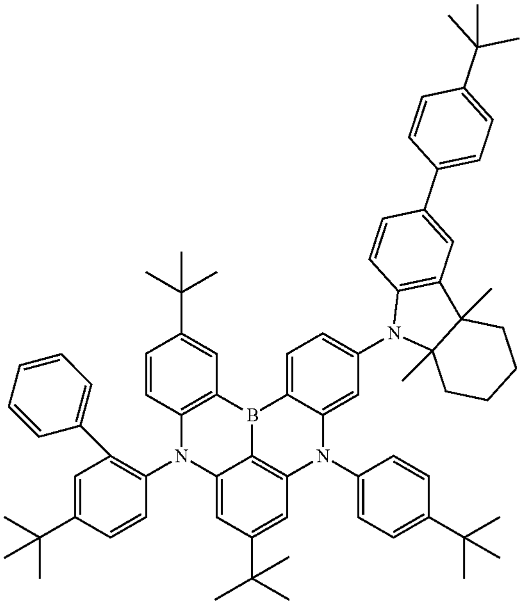
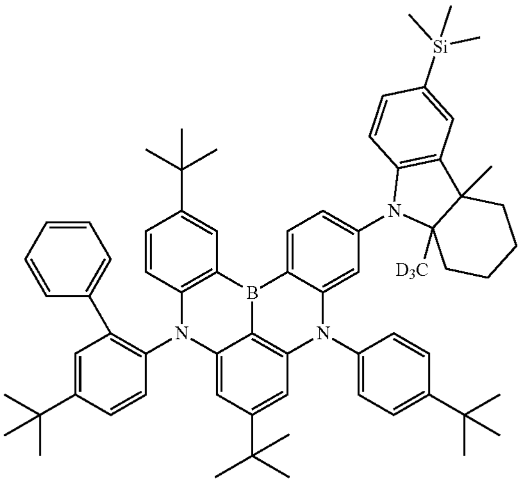

-continued
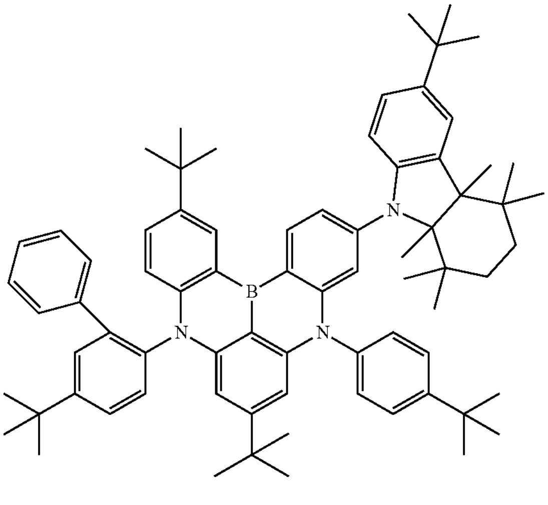
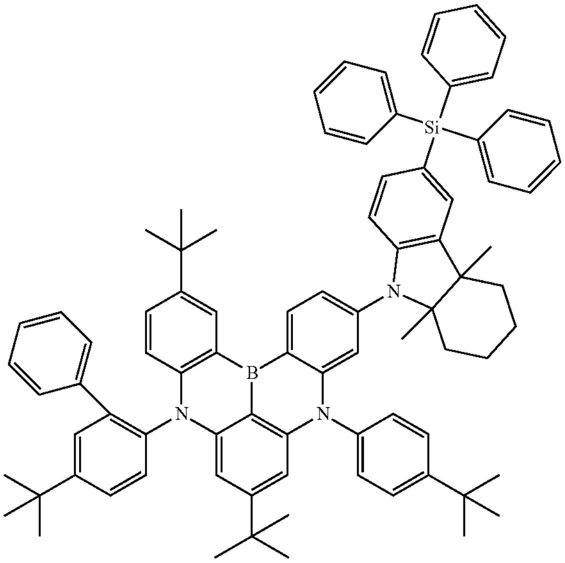
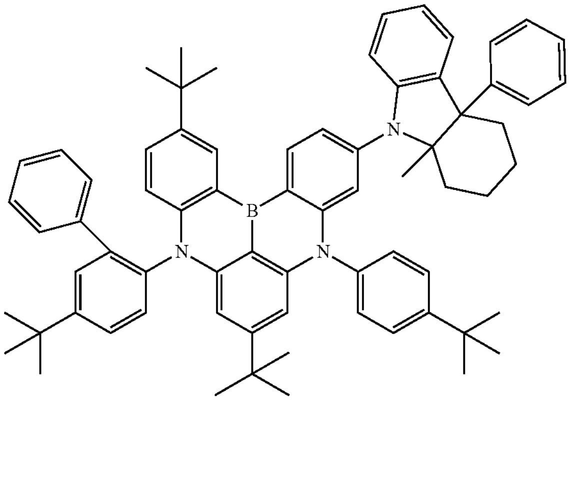
-continued
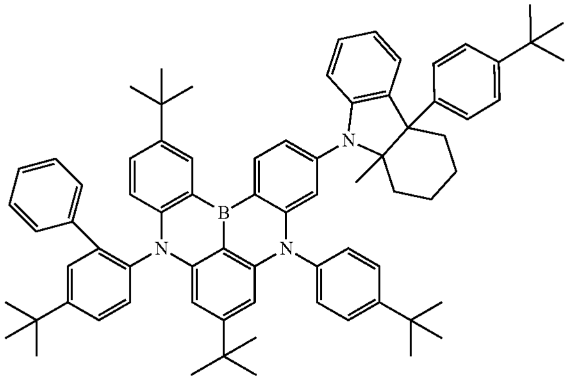
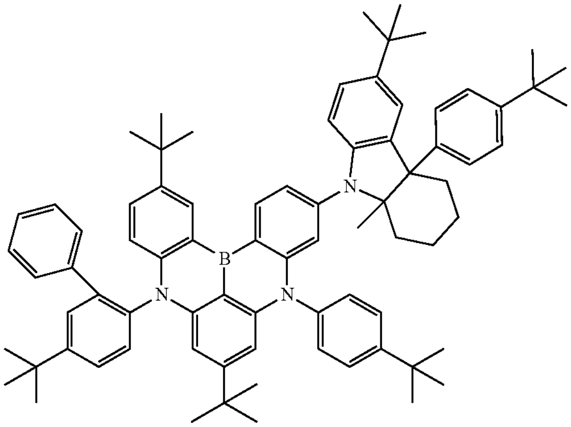
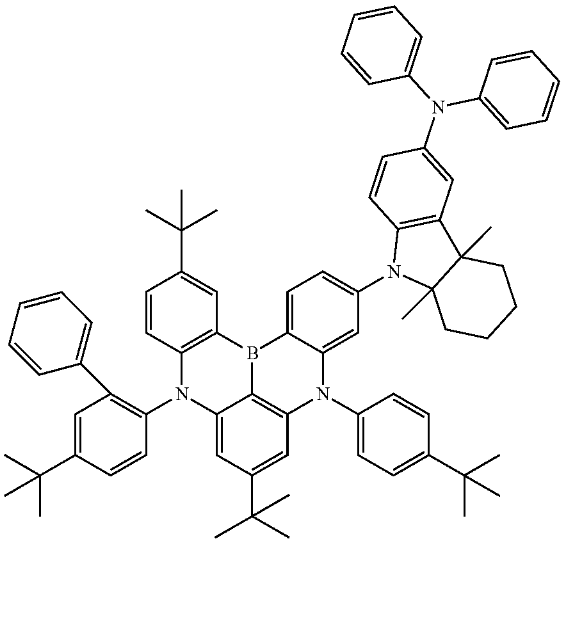

-continued
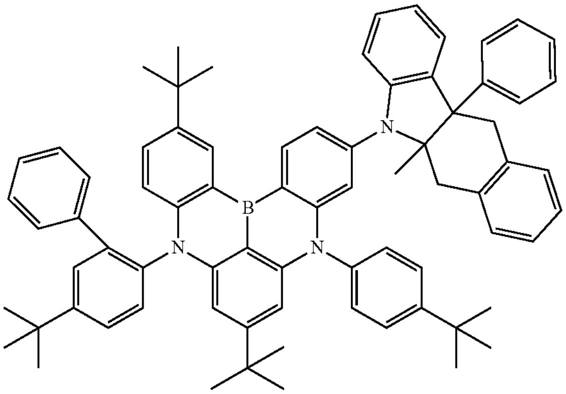
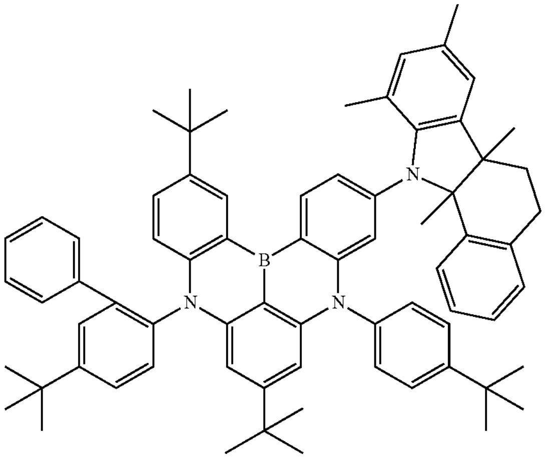
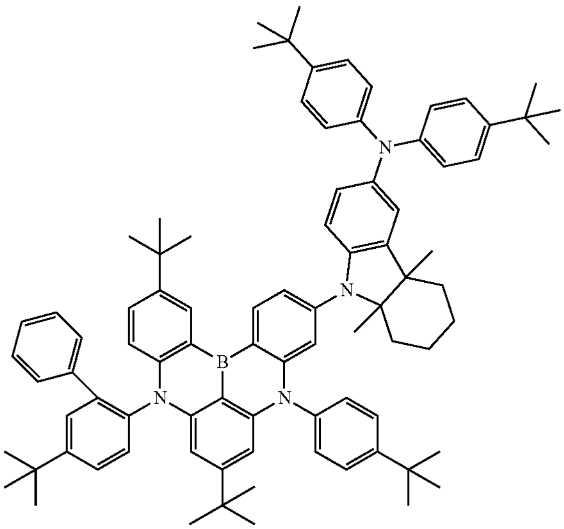
-continued
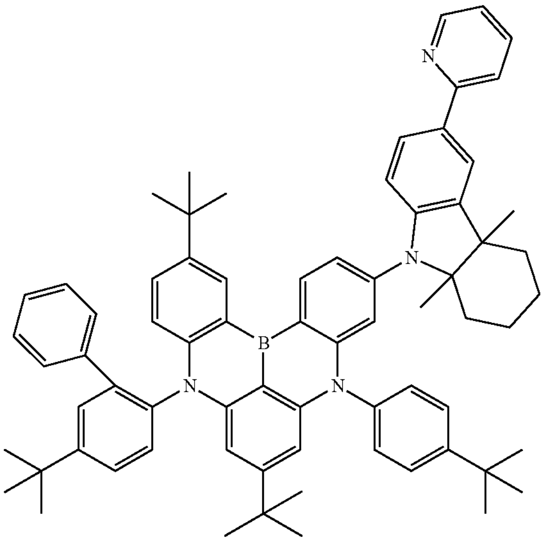
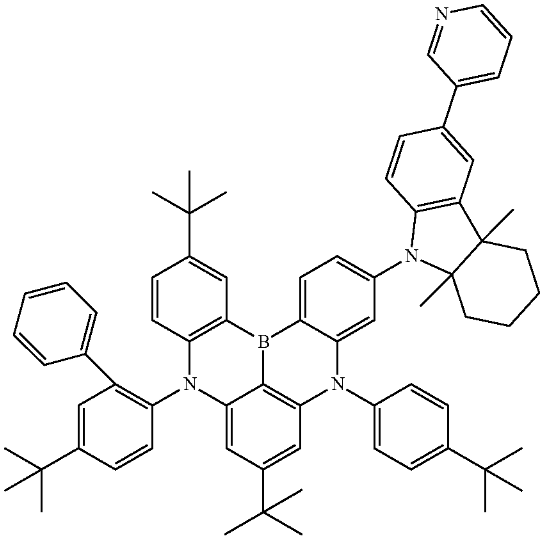
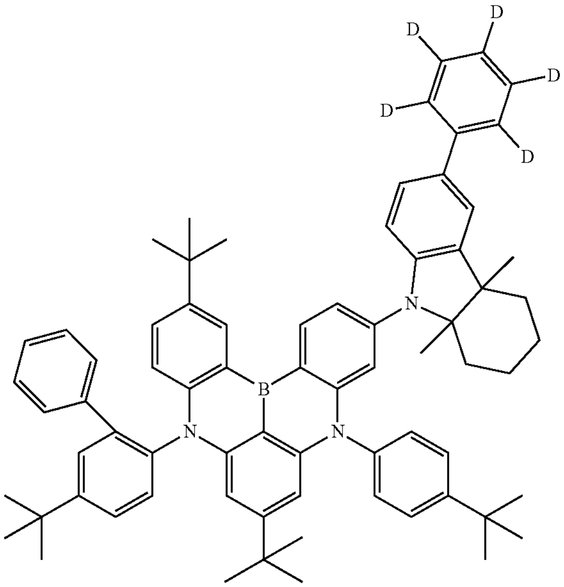

-continued
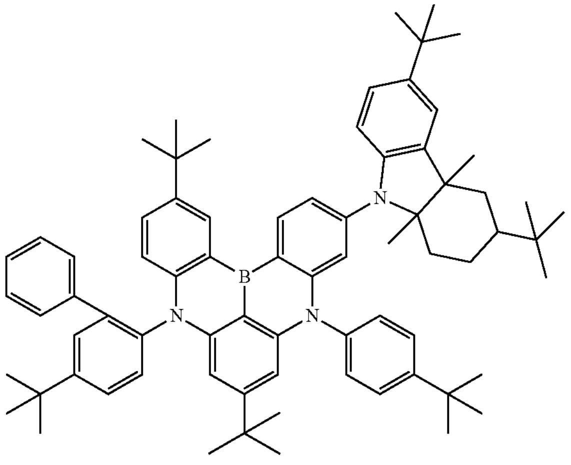
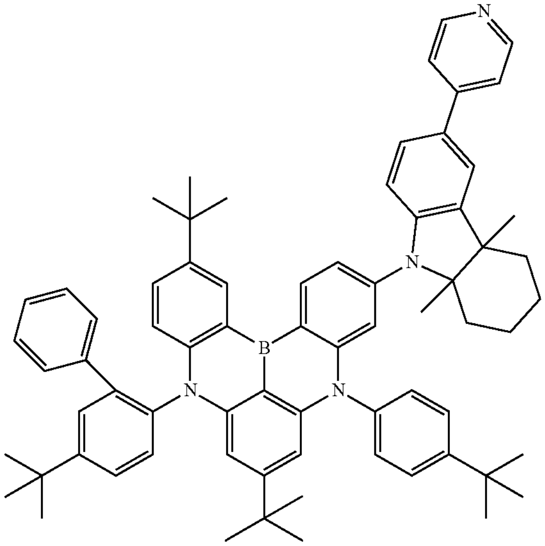
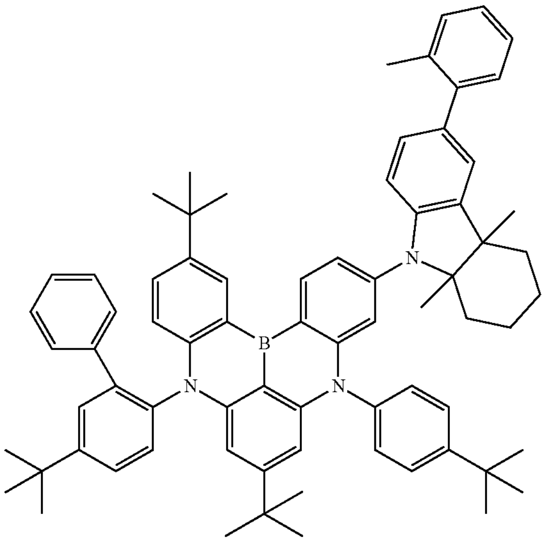
-continued
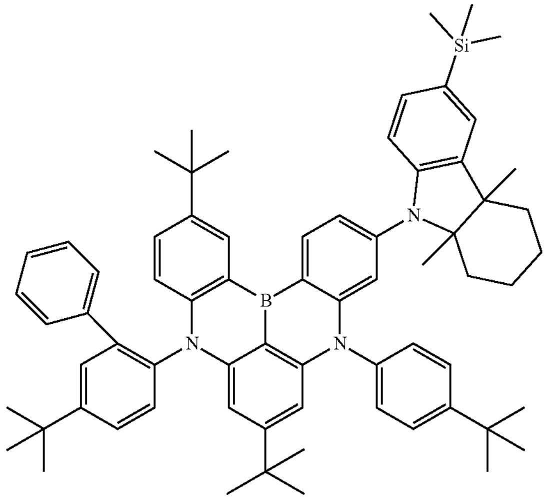
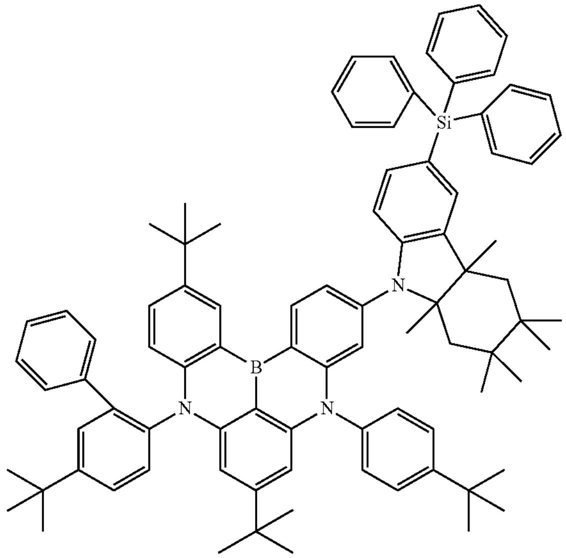
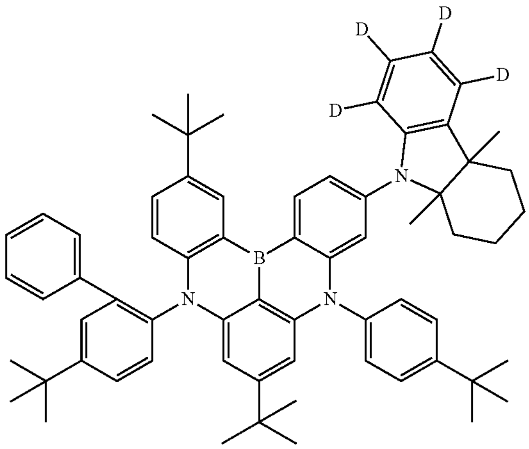

-continued
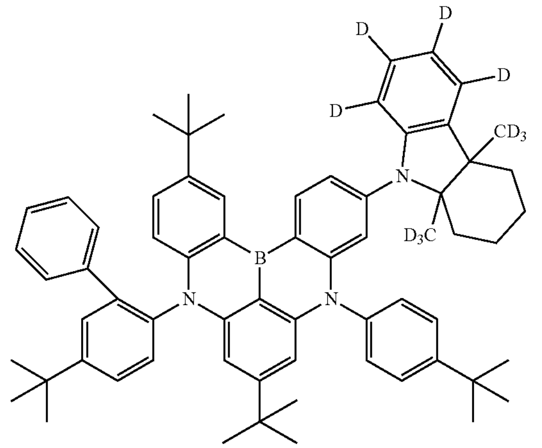
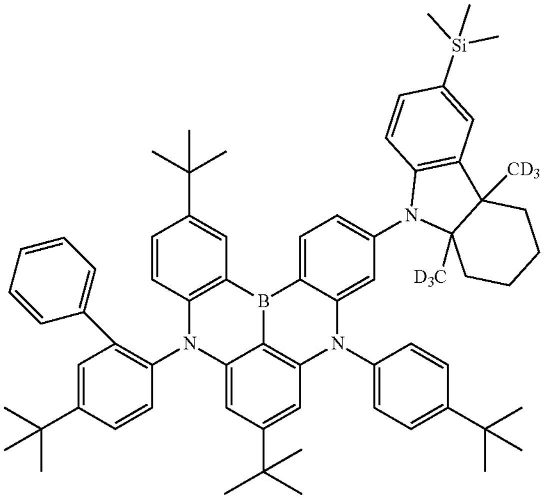
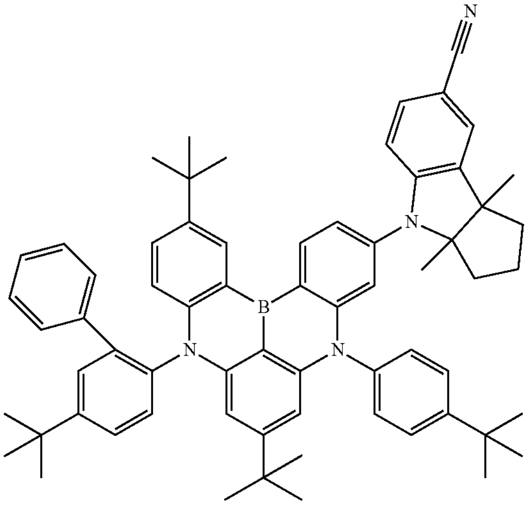
-continued
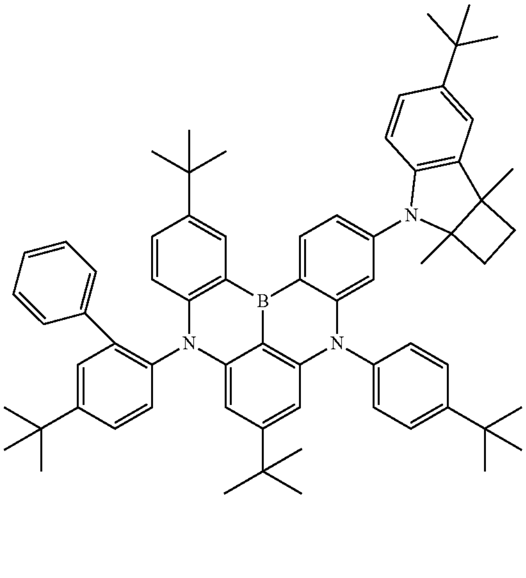
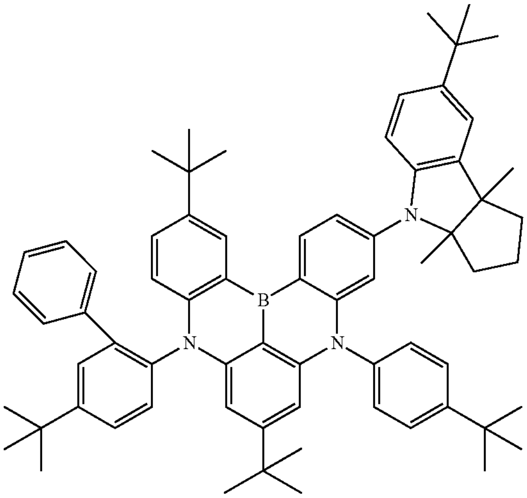
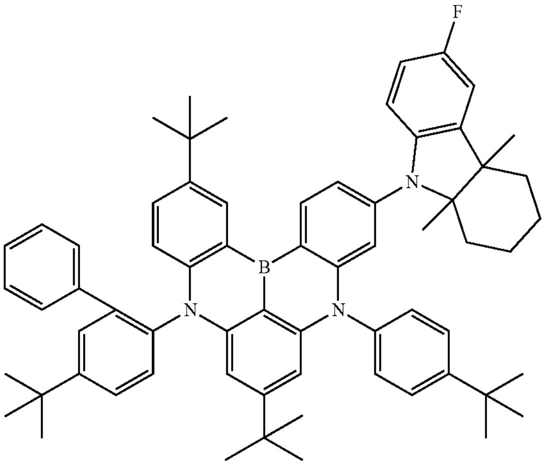

-continued
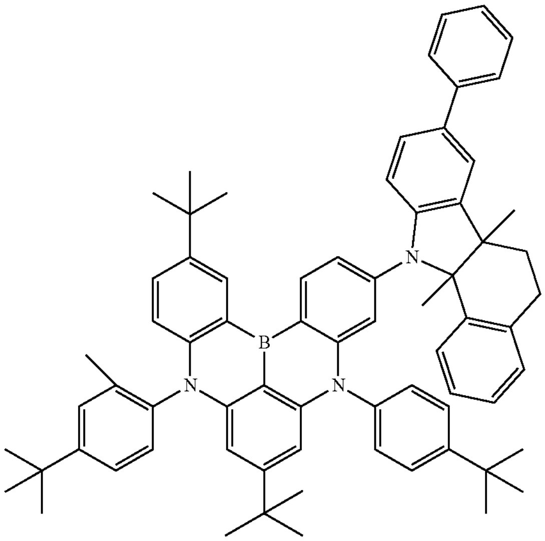
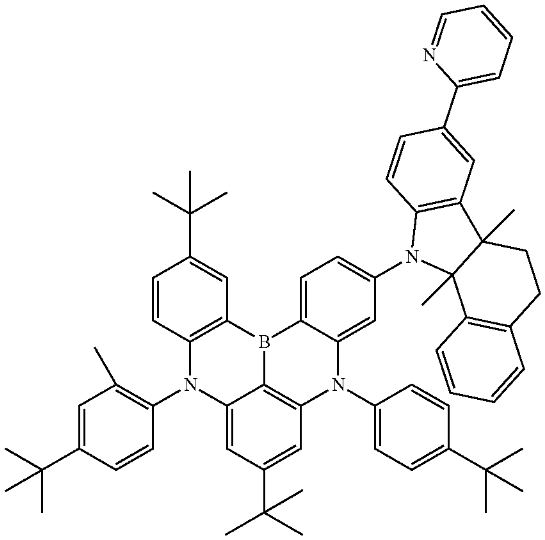
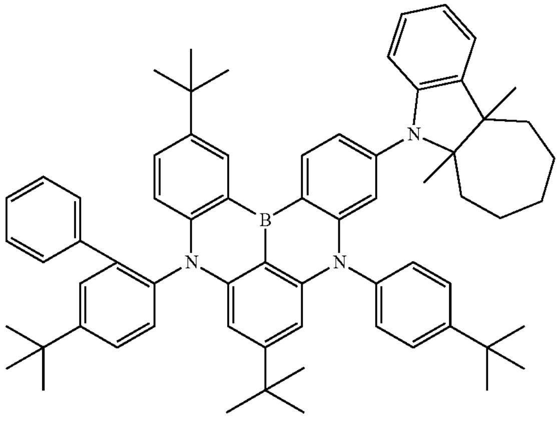
-continued
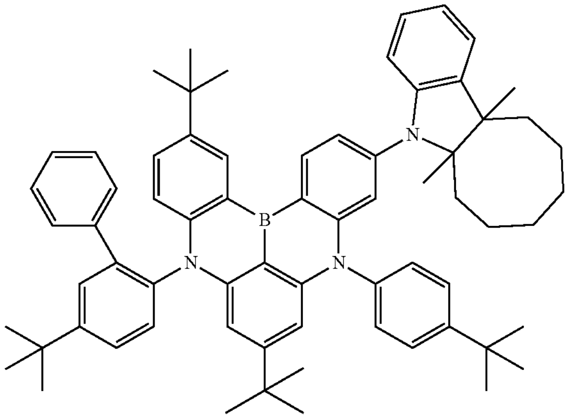
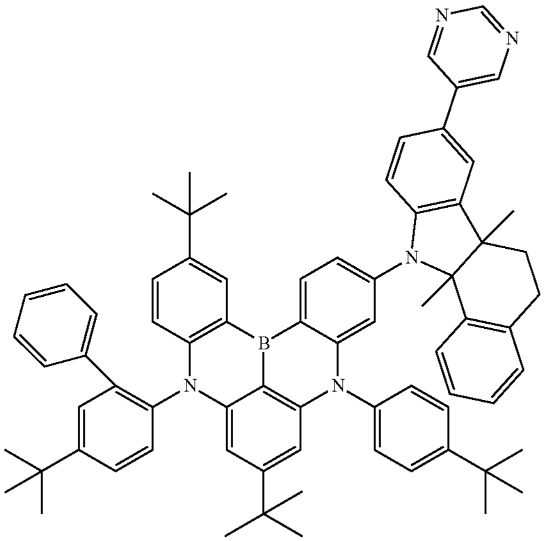
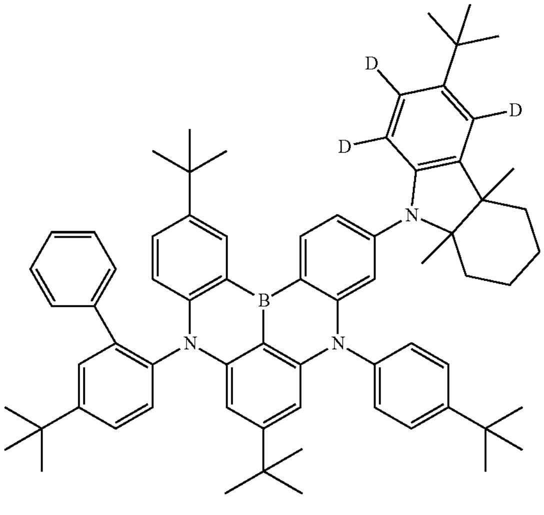

-continued
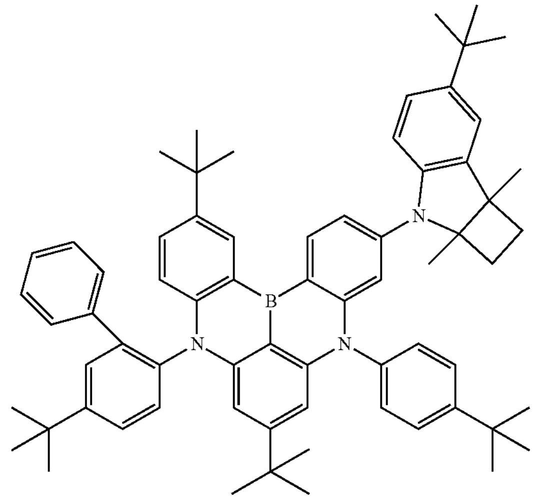
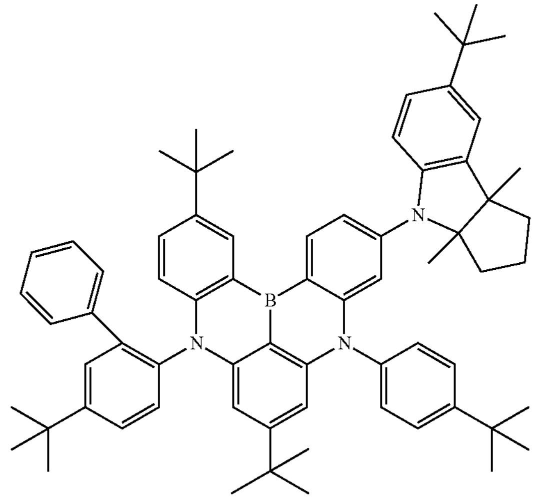
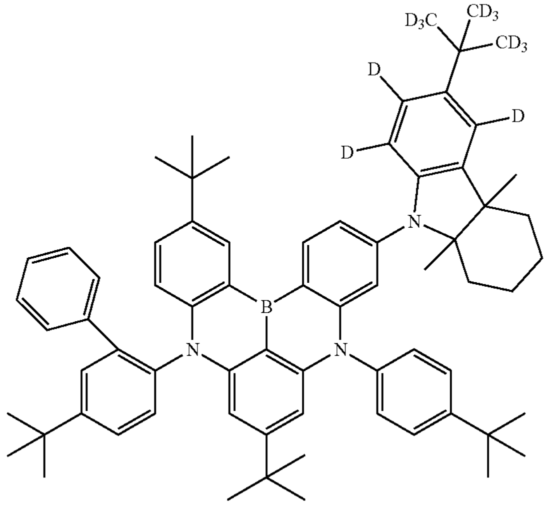
-continued
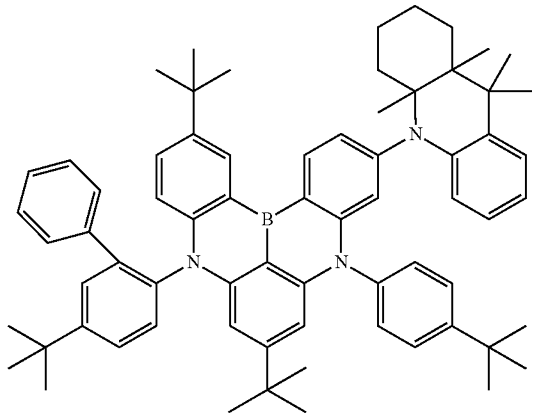
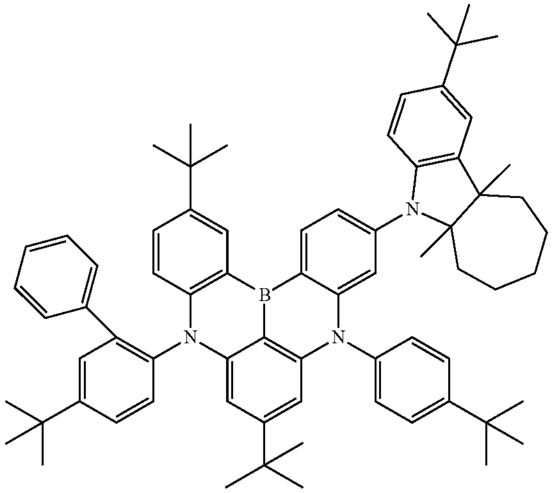
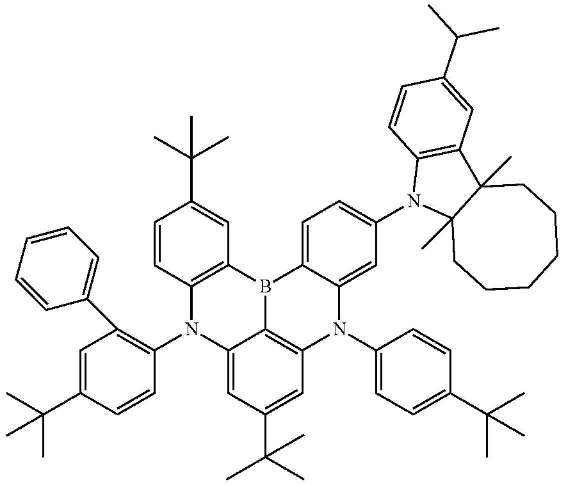

-continued
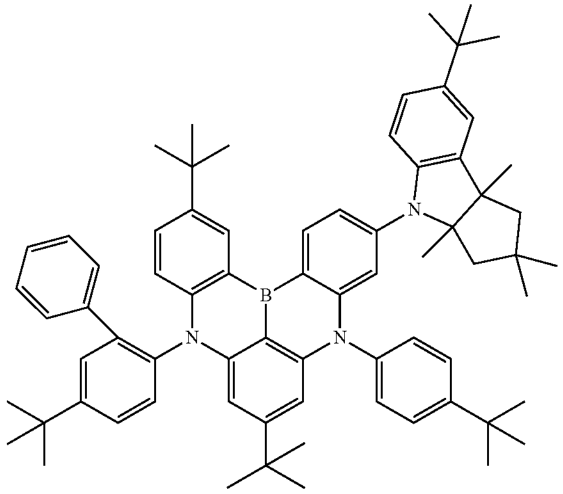
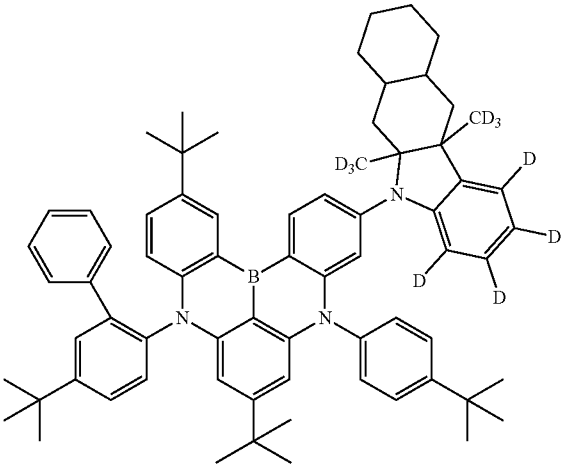
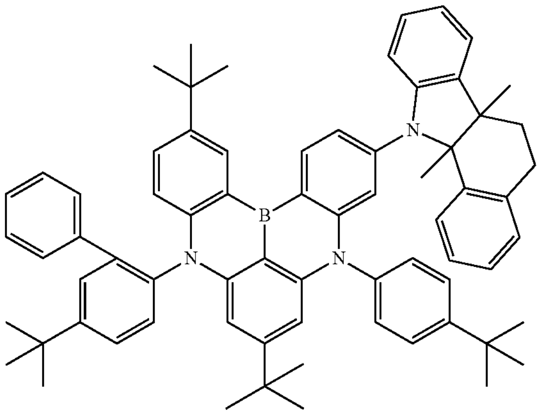
-continued
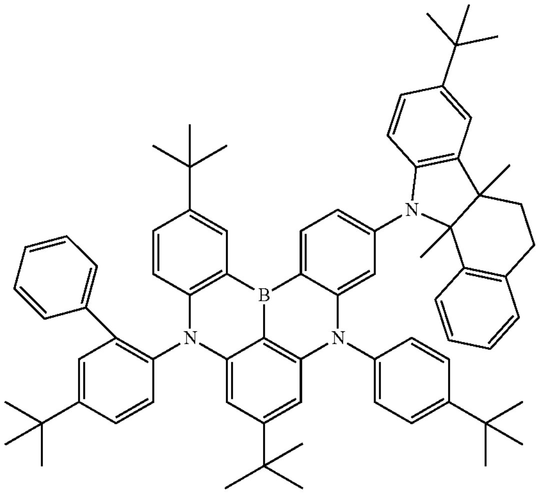
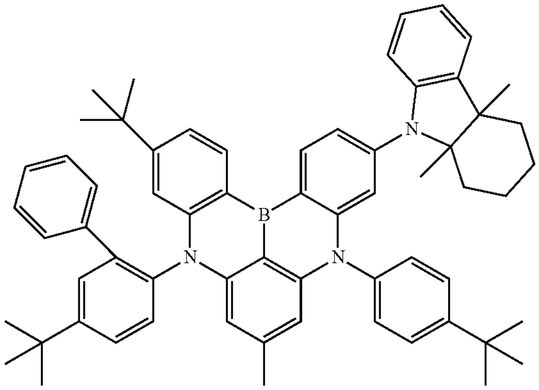
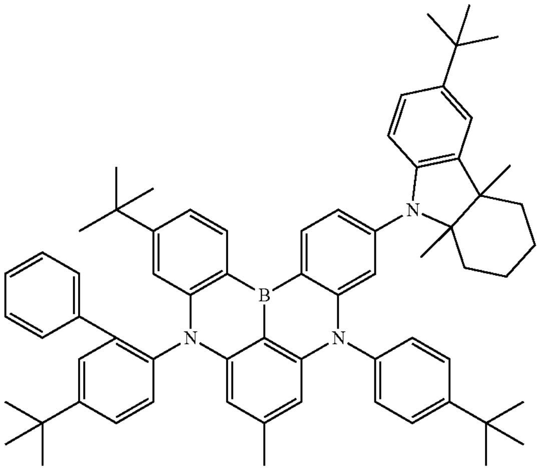

-continued
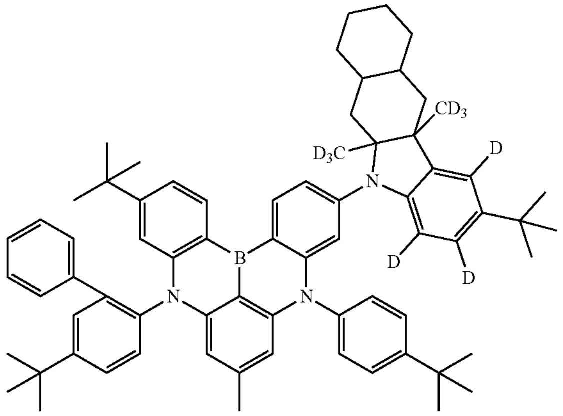
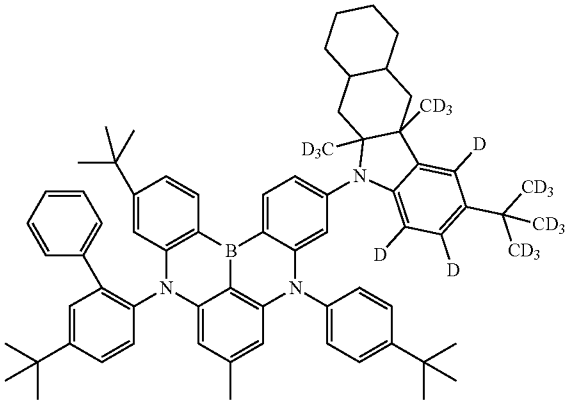
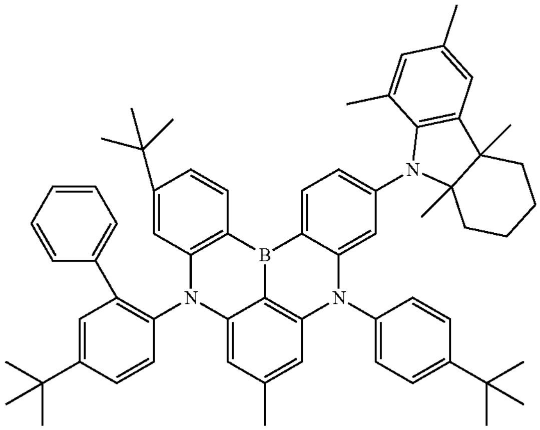
-continued
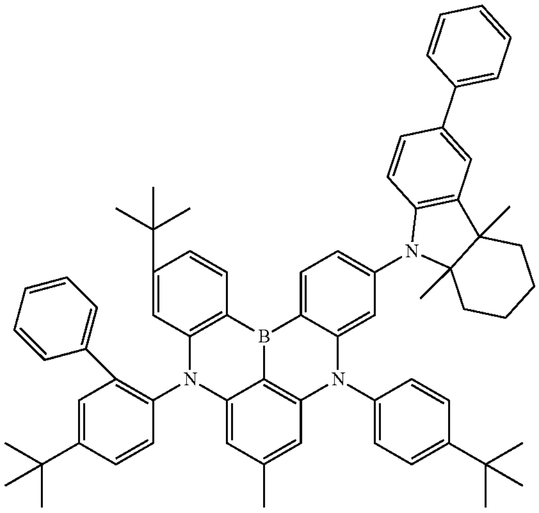
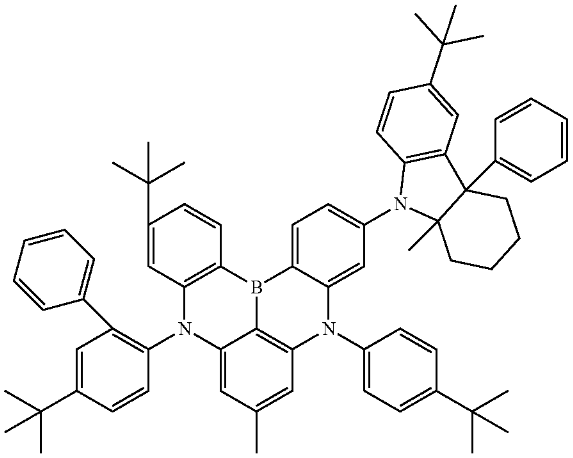
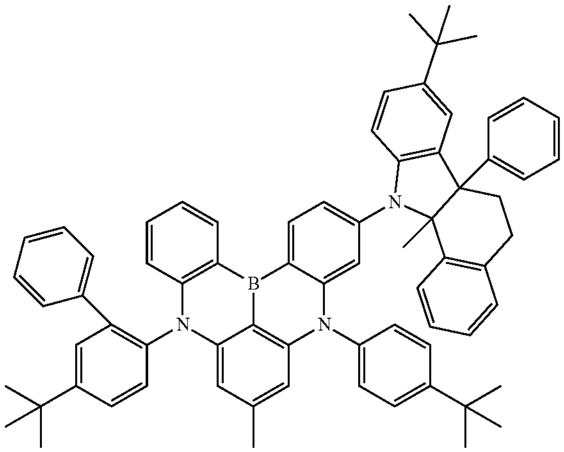

-continued
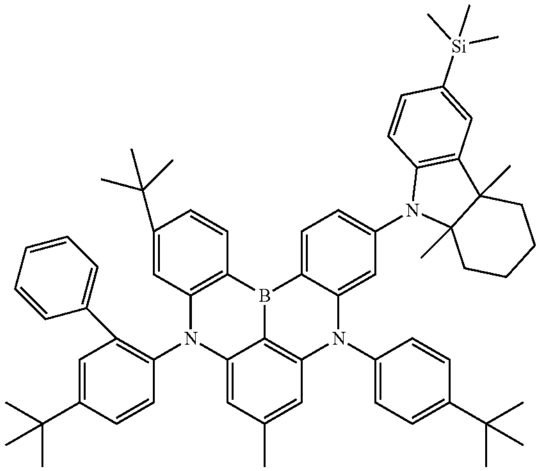
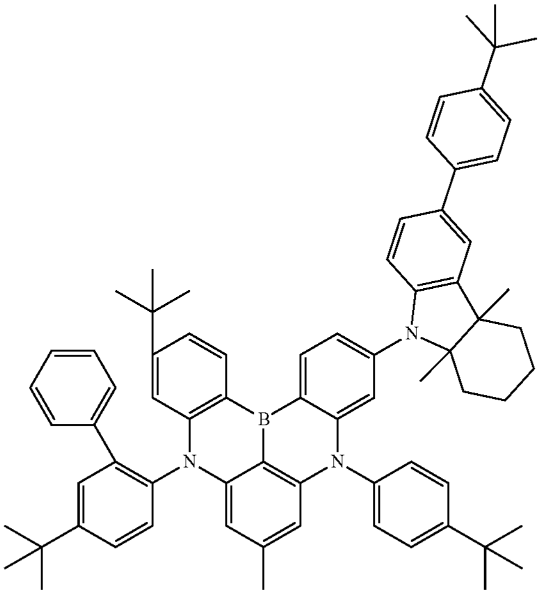
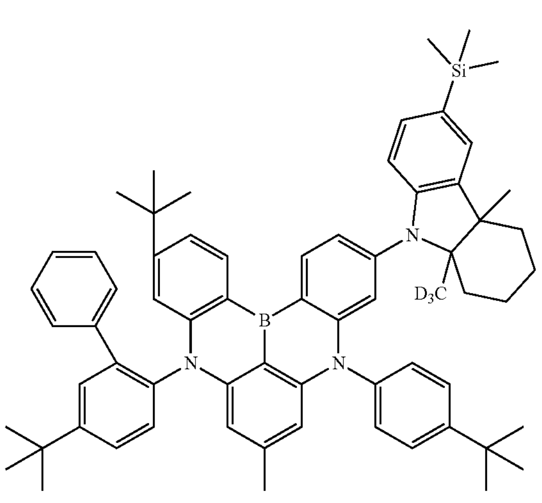
-continued
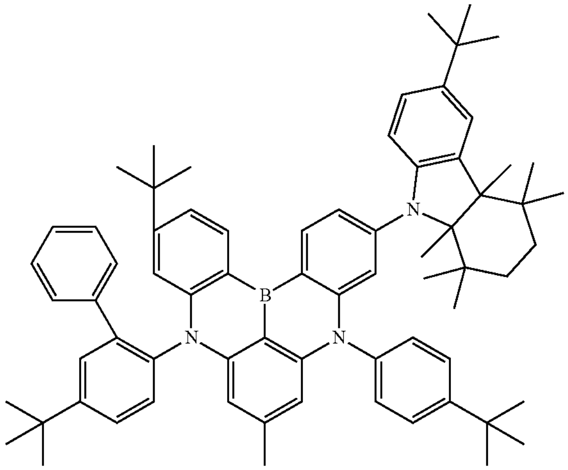
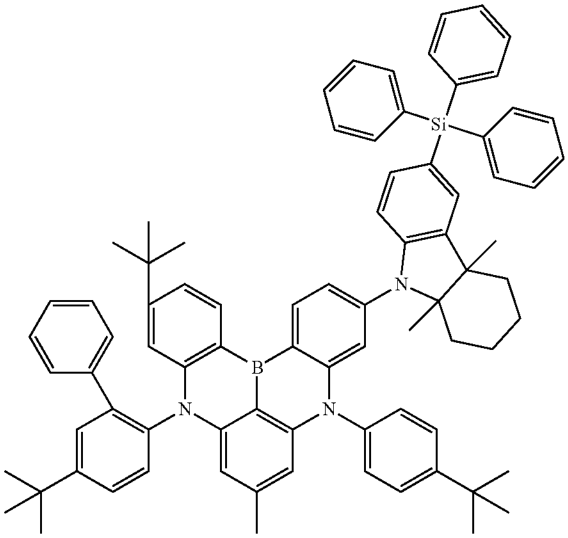
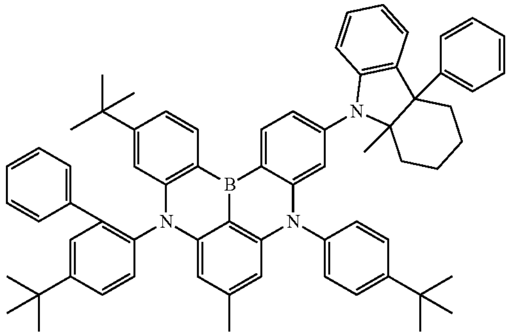
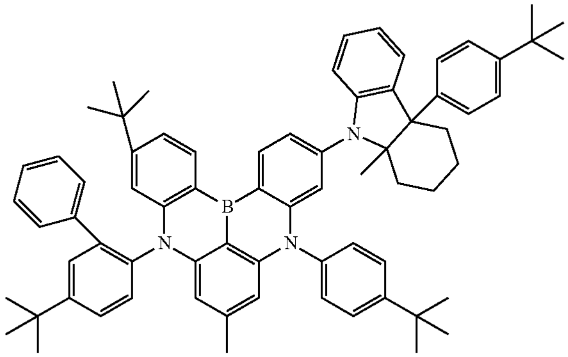

-continued
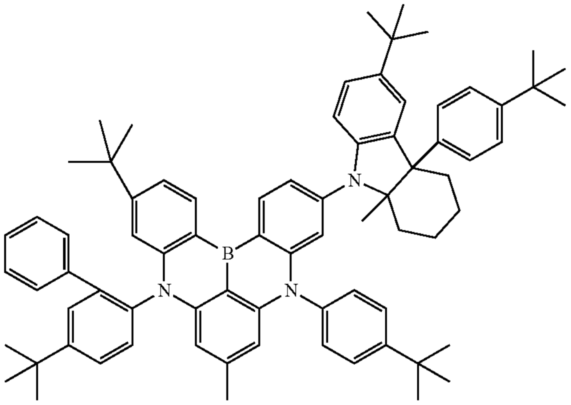
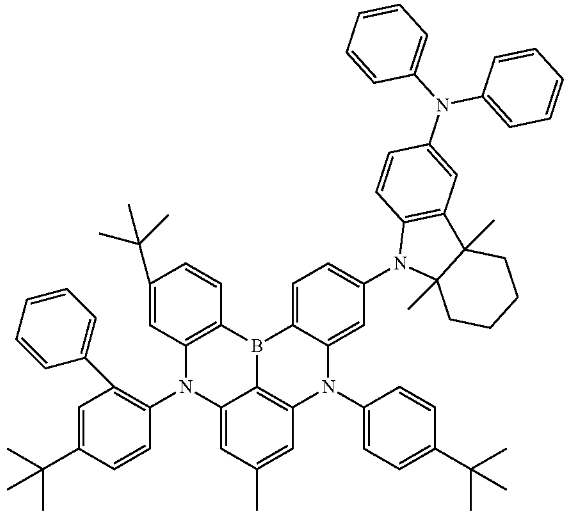
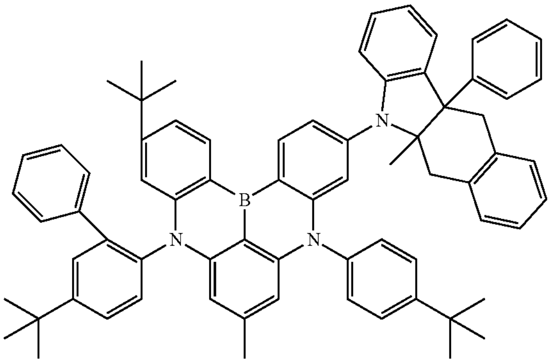
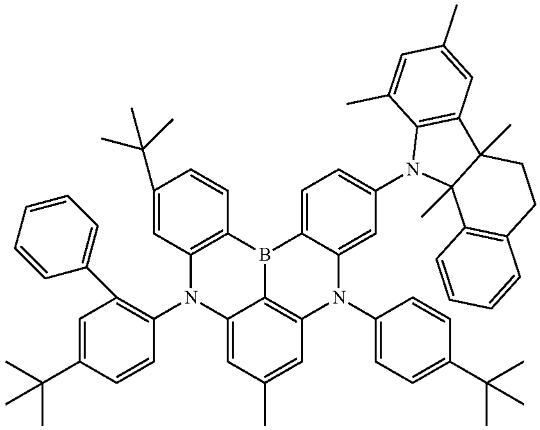
-continued
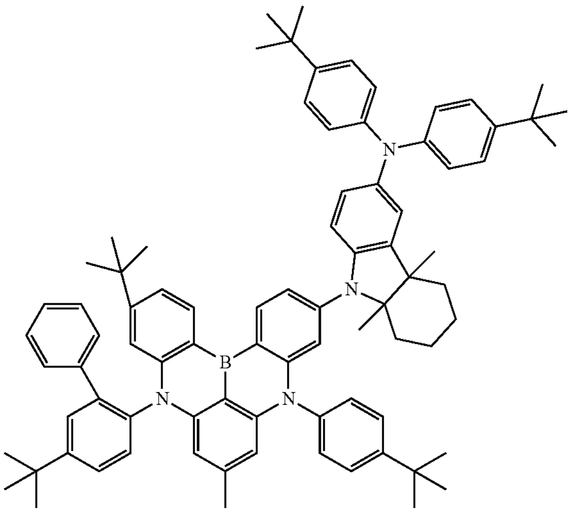
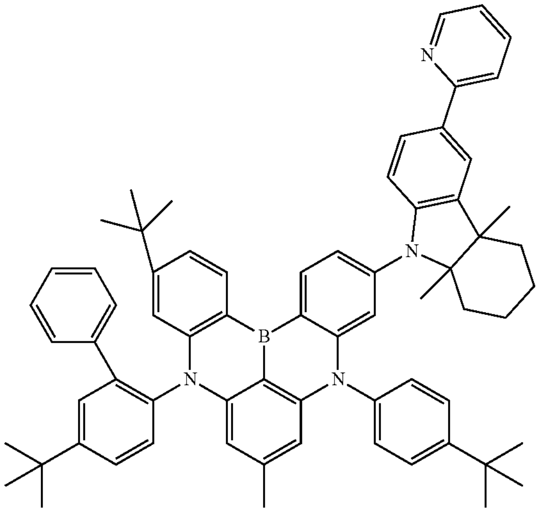
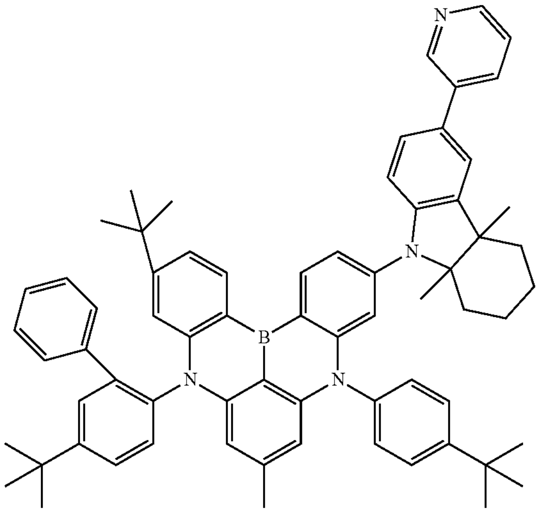

-continued
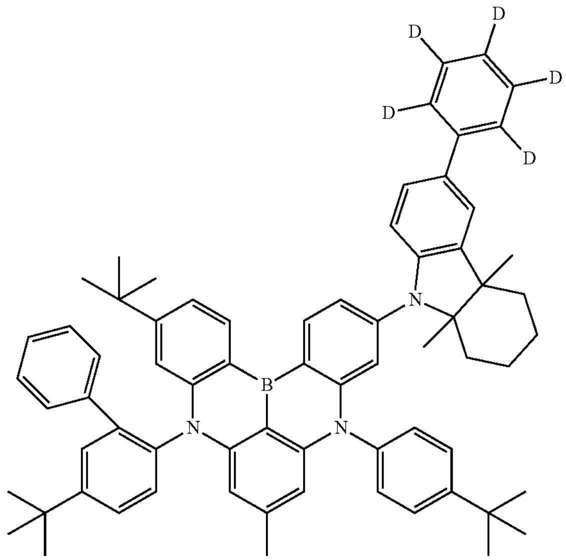
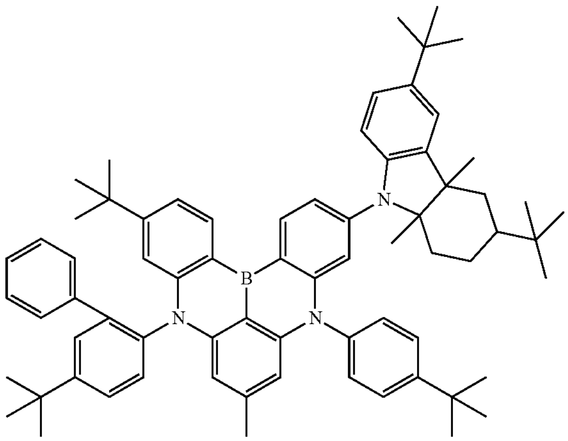
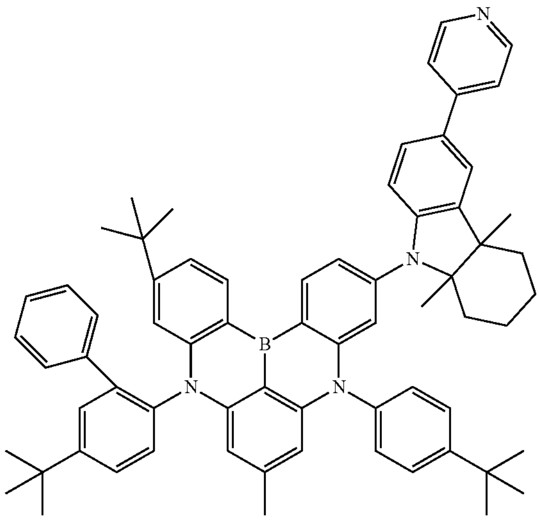
-continued
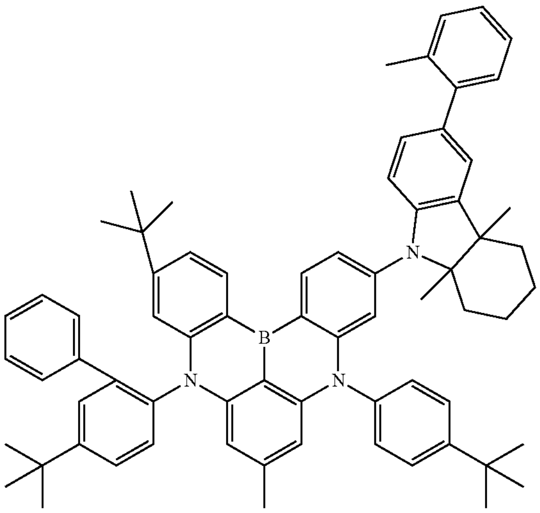
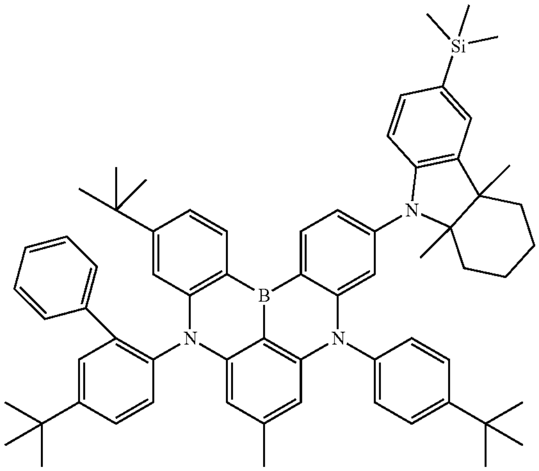
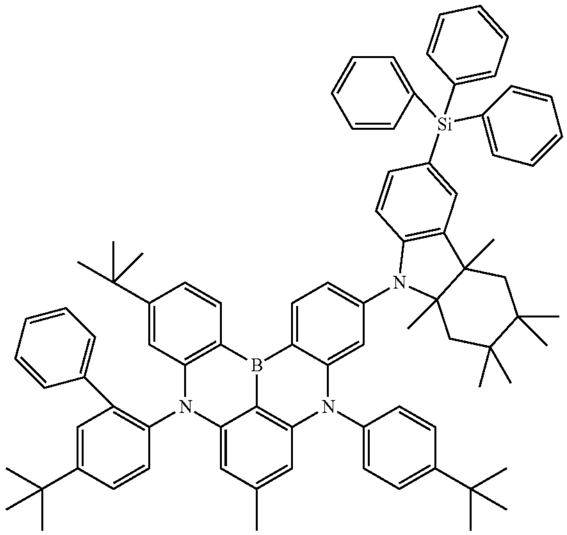

-continued
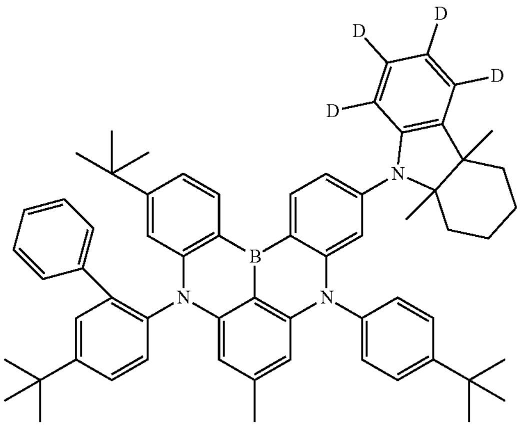
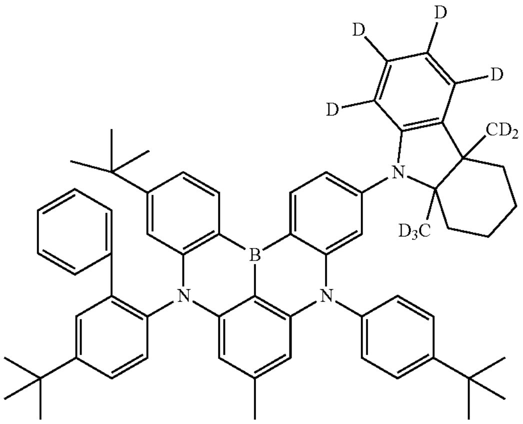
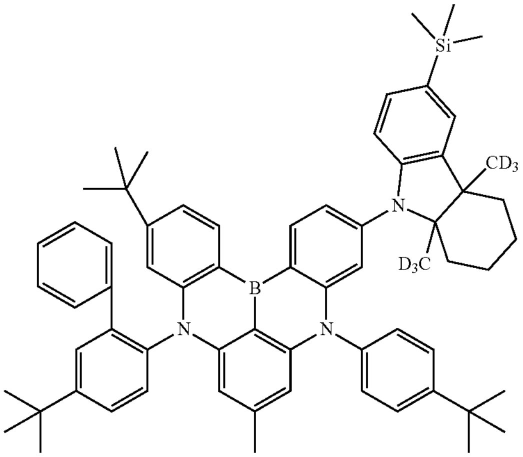
-continued
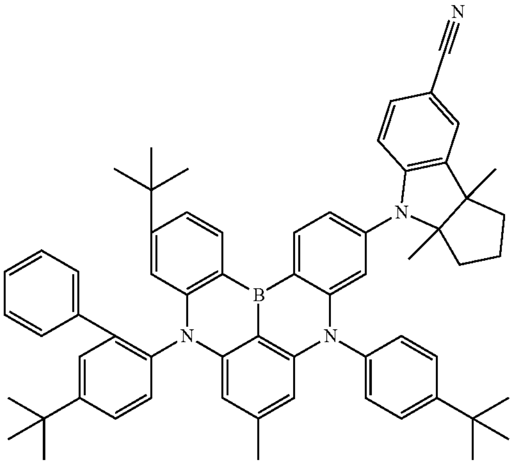
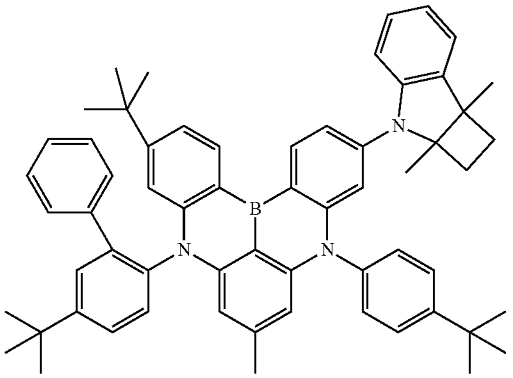
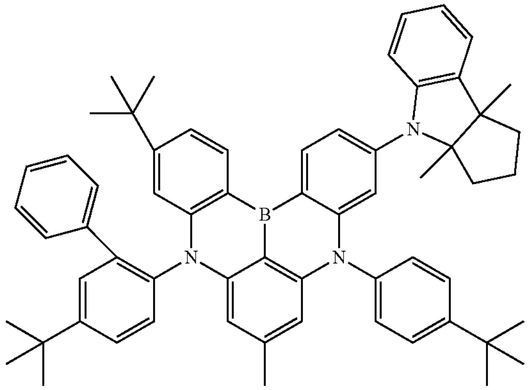
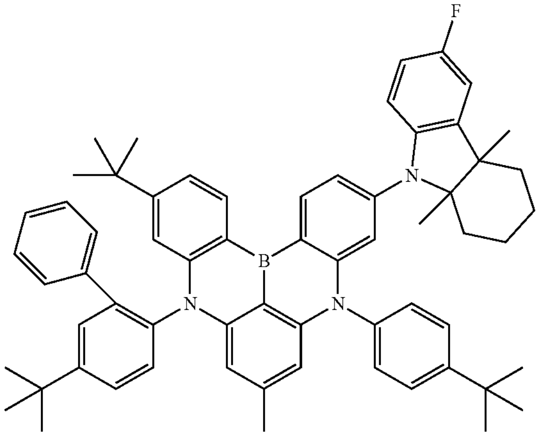

-continued
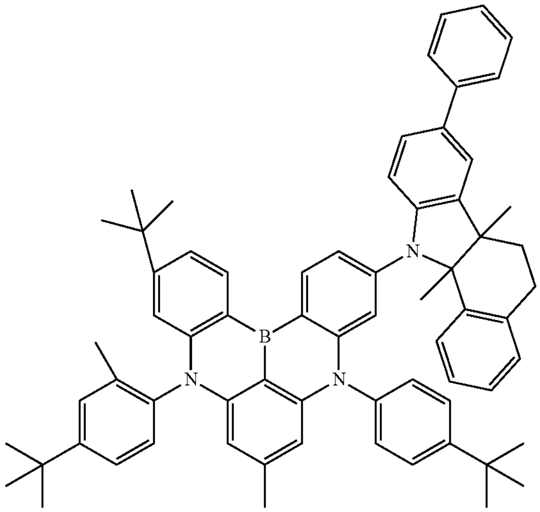
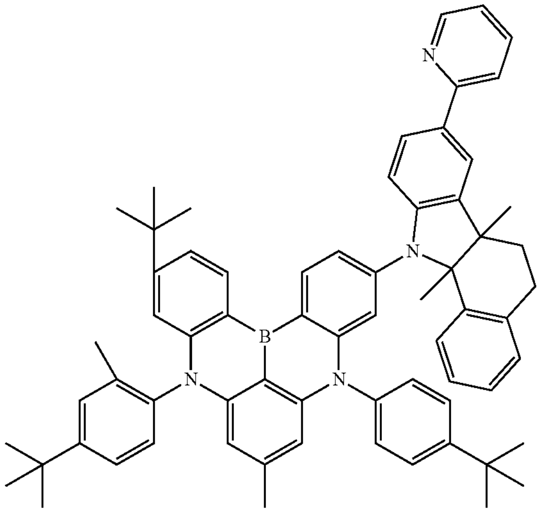
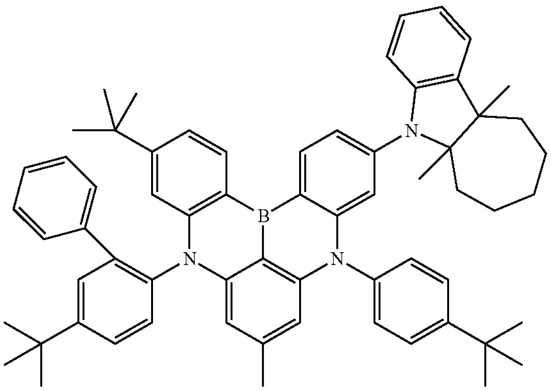
-continued
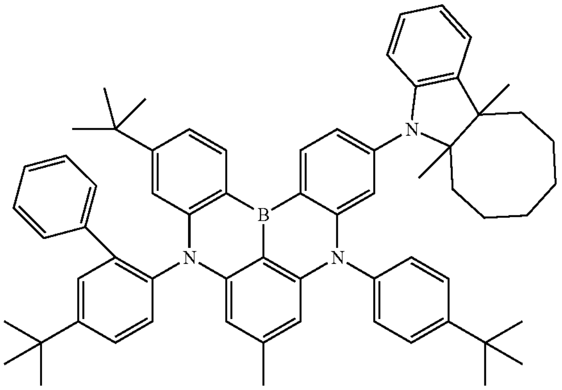
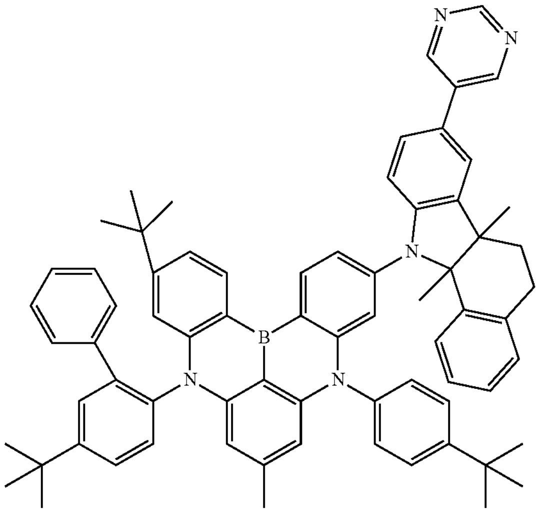
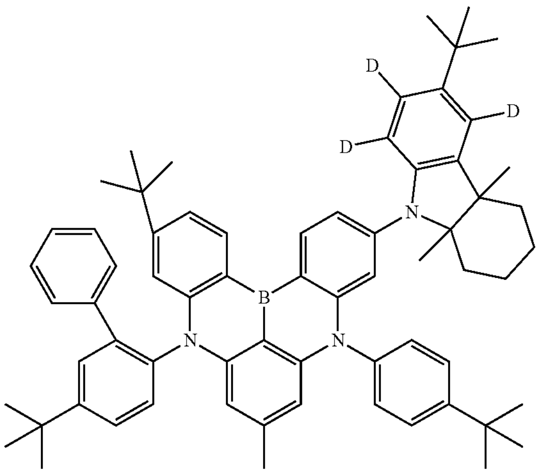

-continued
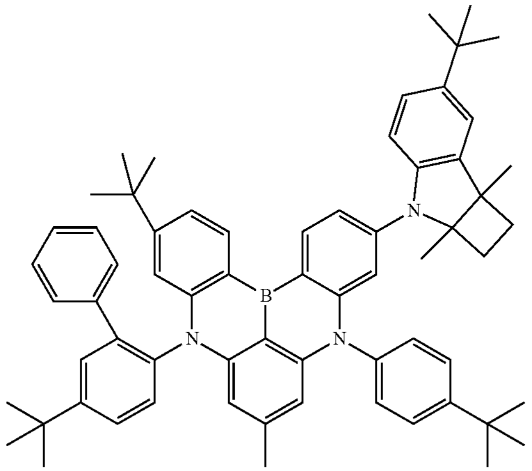
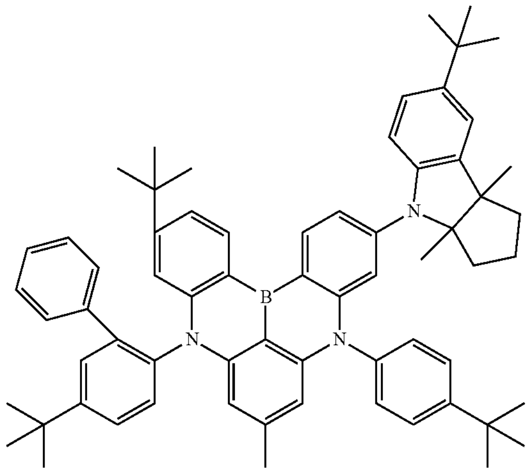
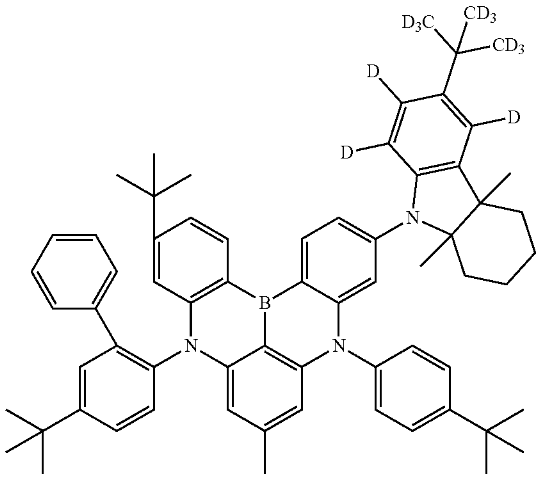
-continued
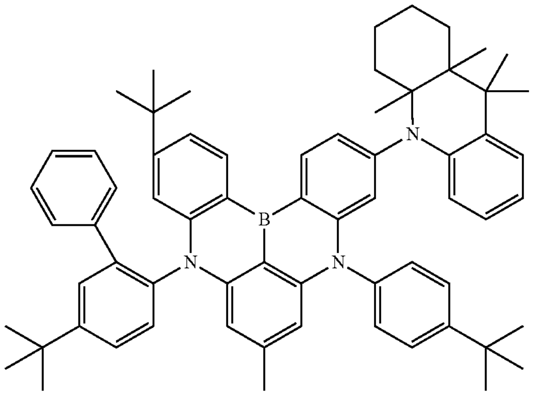
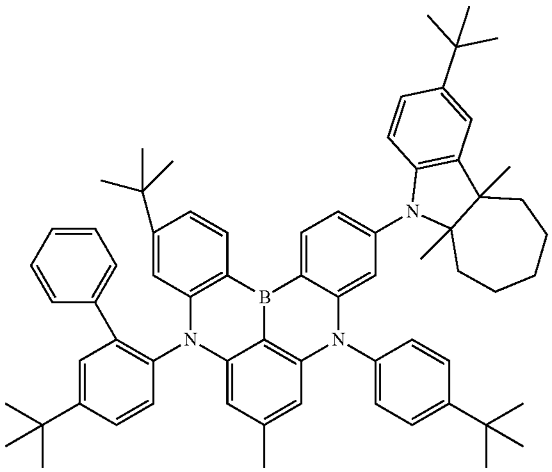
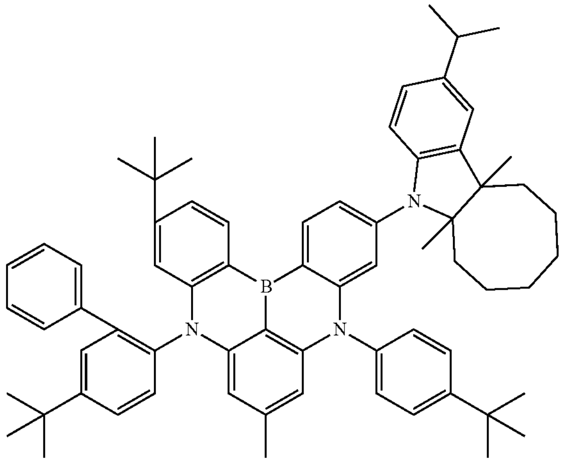

-continued
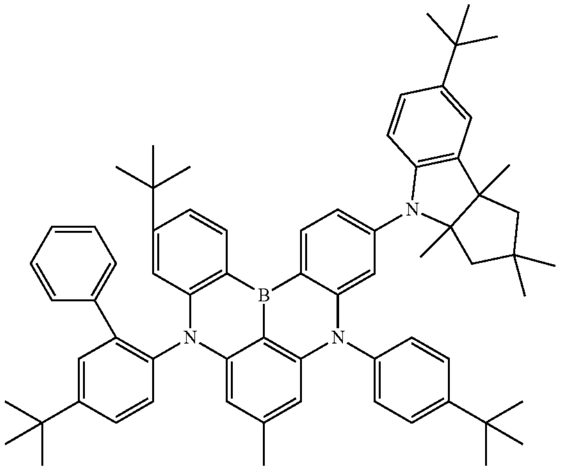
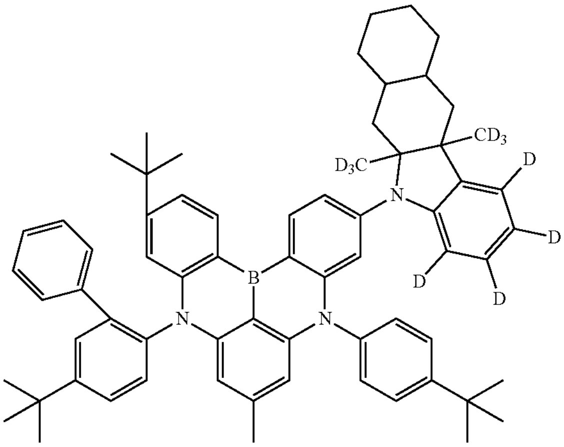
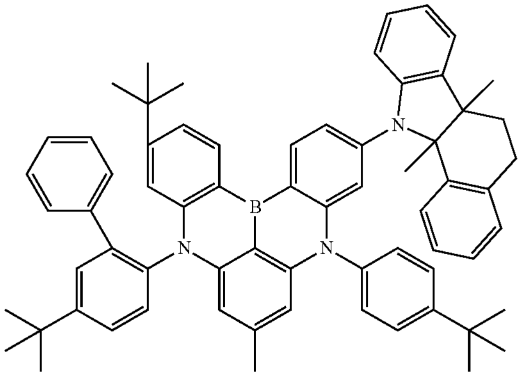
-continued
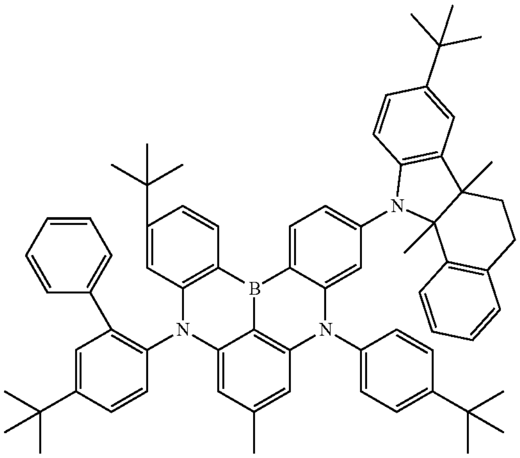
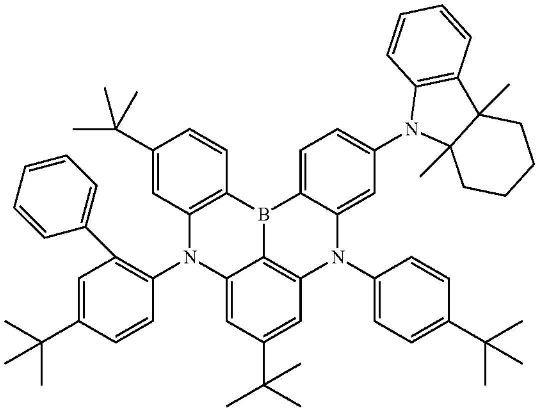
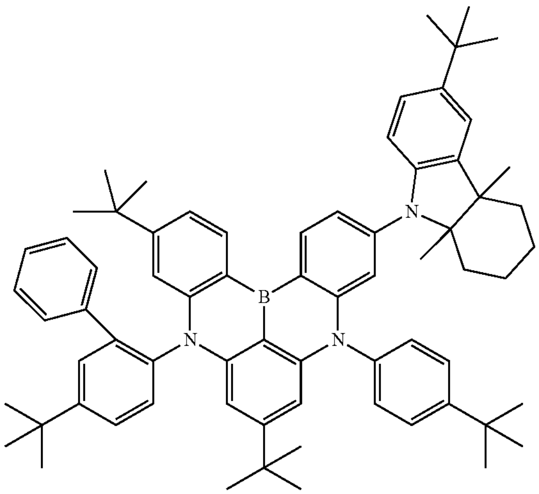

-continued
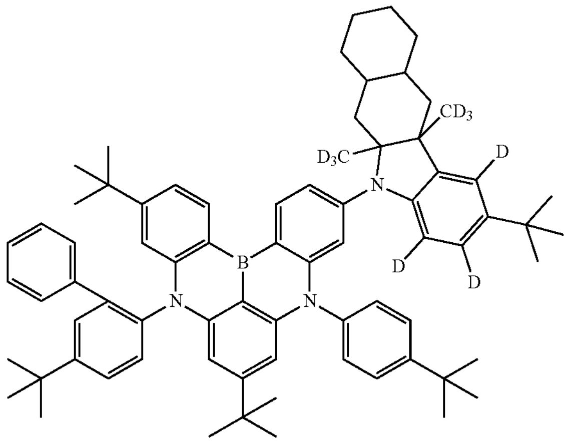
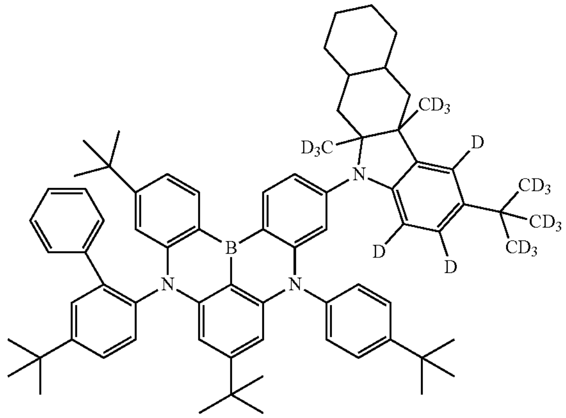
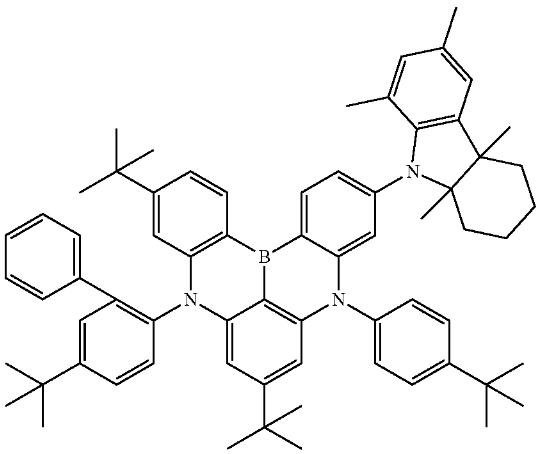
-continued
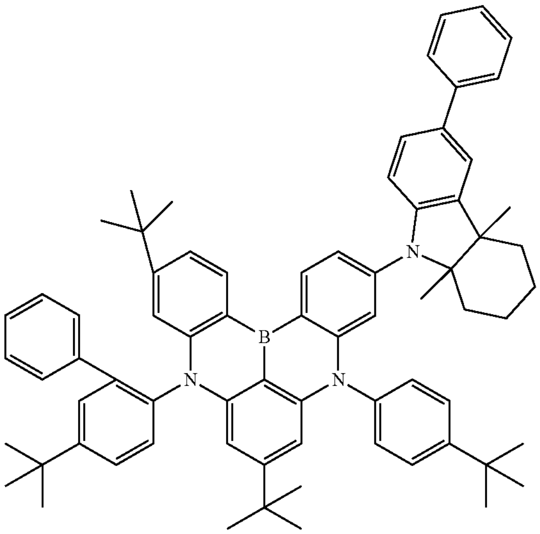
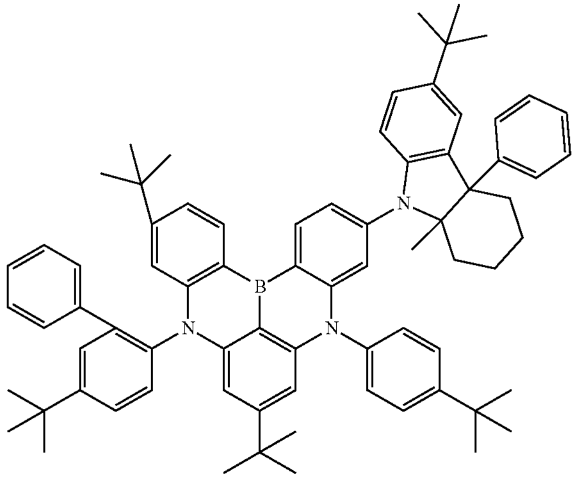
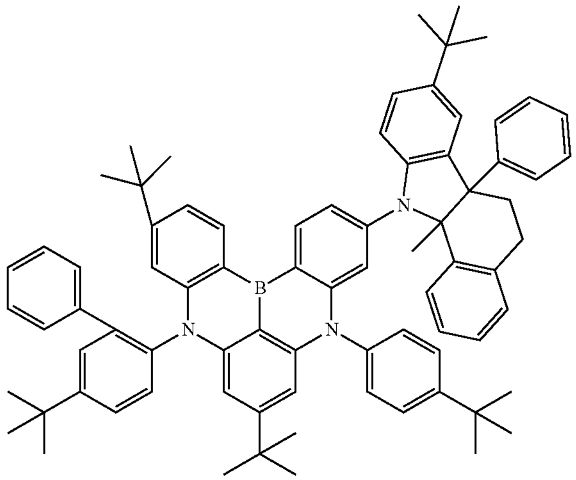

-continued
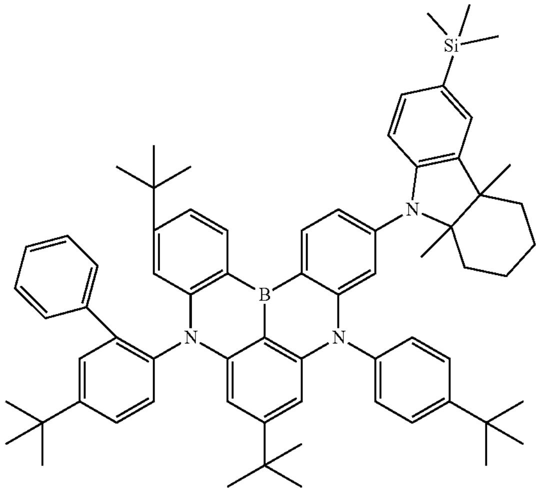
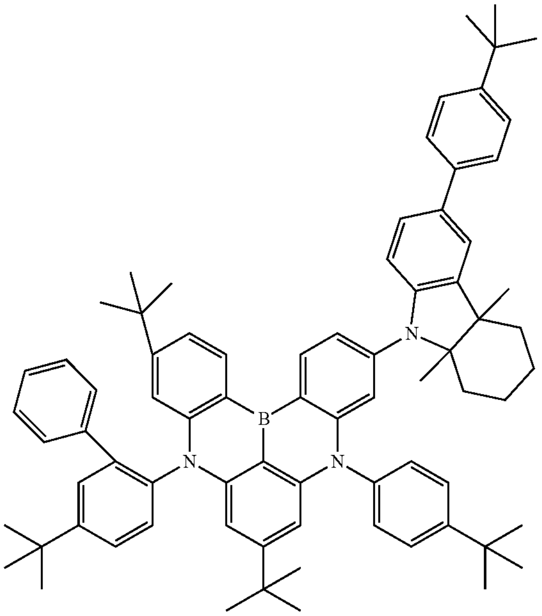
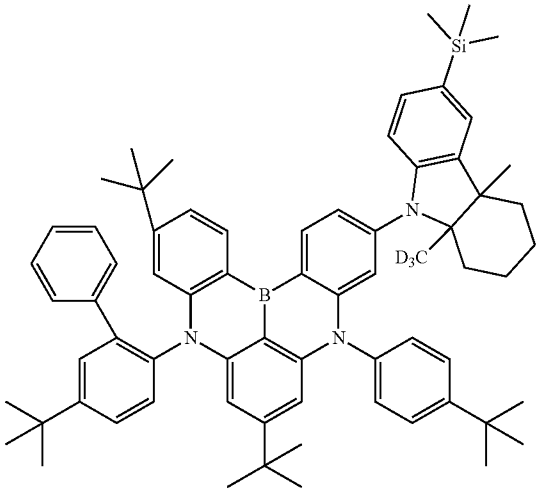
-continued
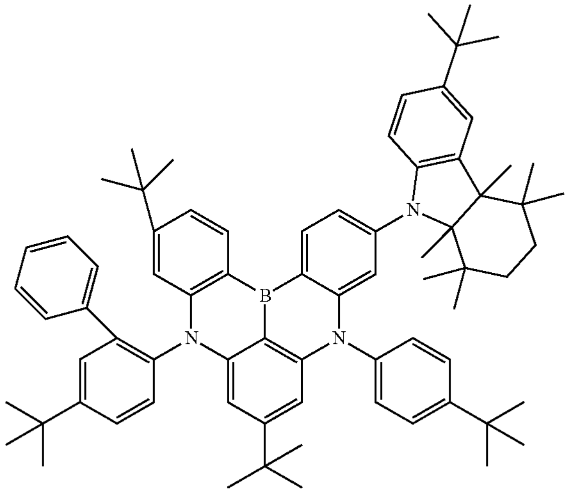
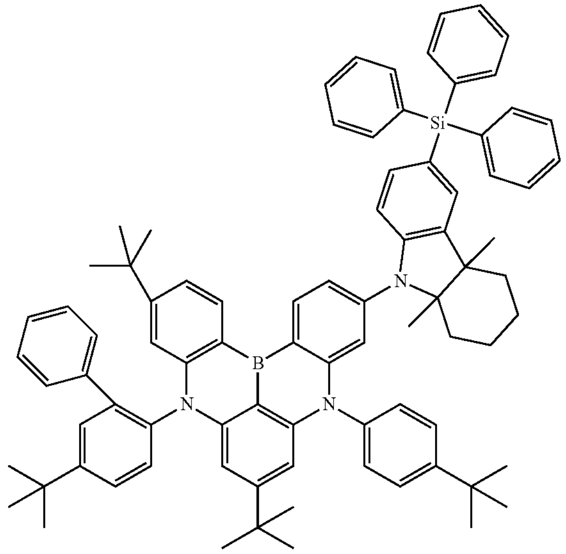
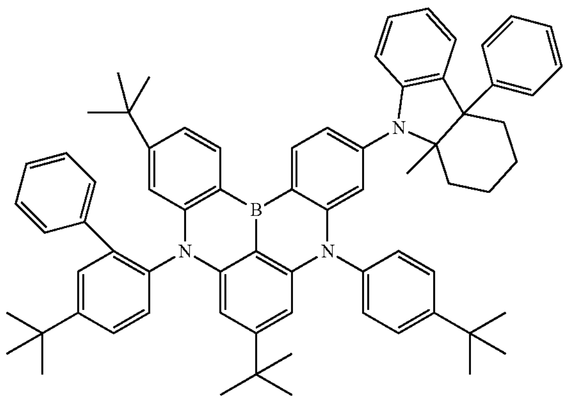

-continued
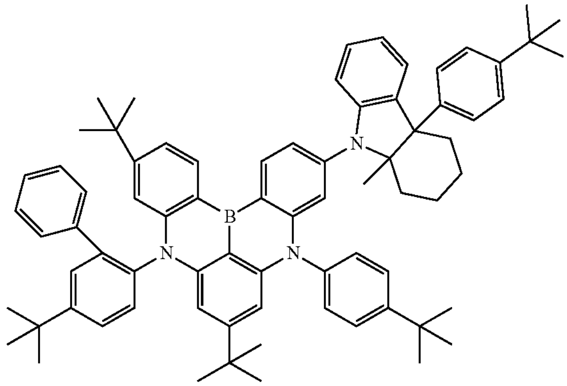
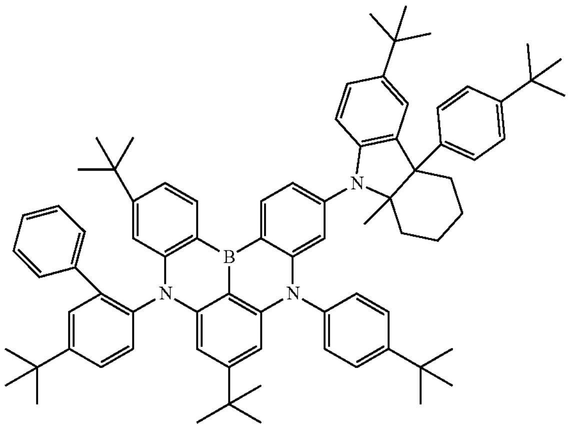
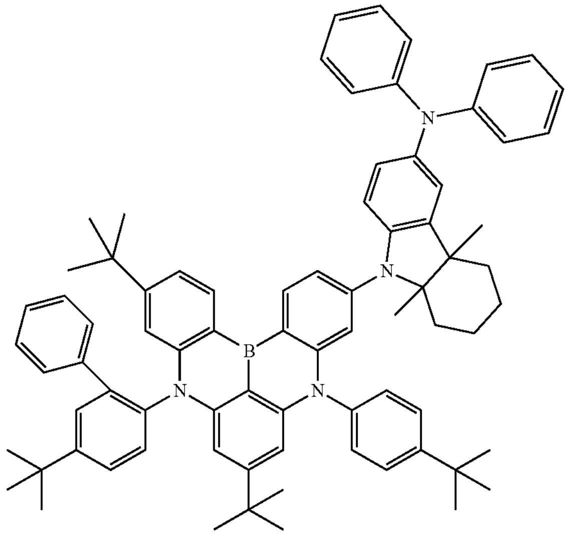
-continued
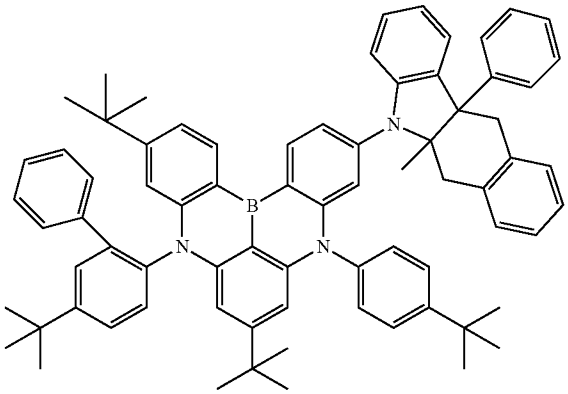
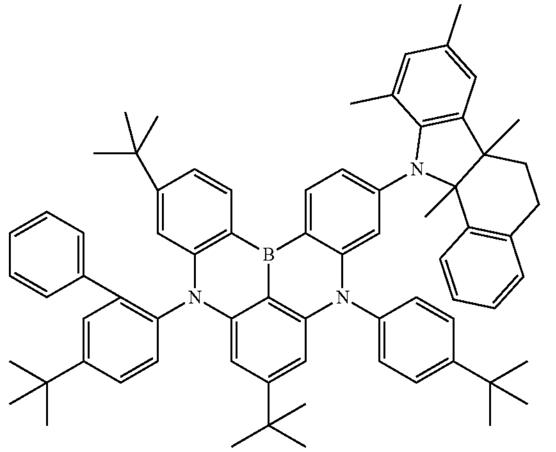
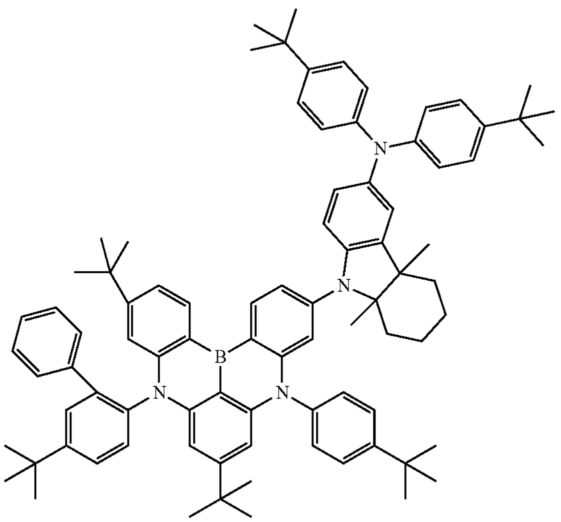

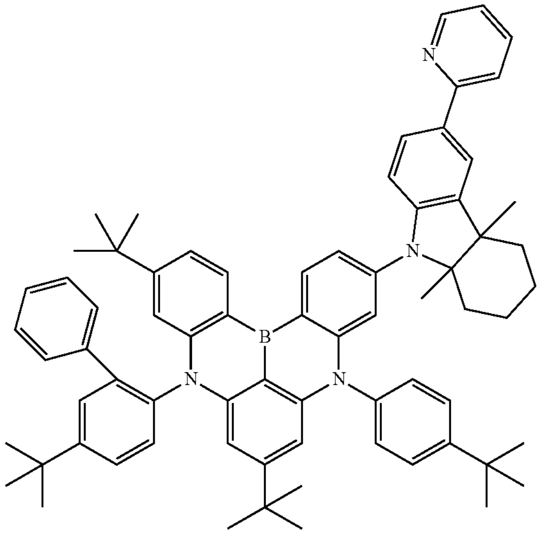
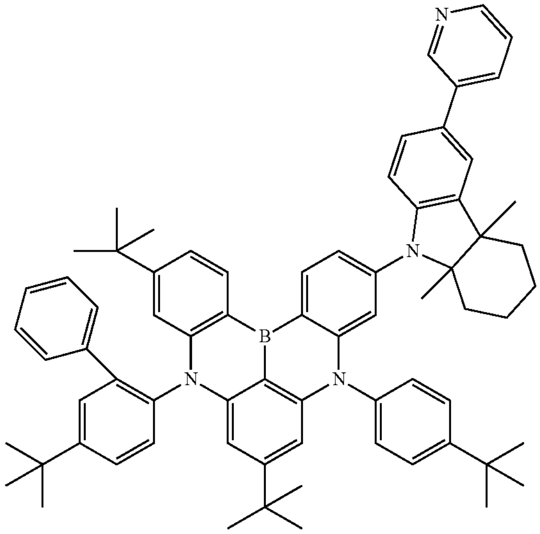
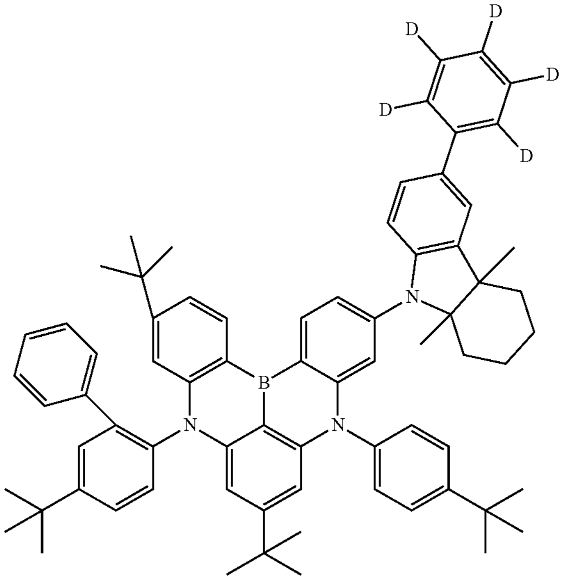
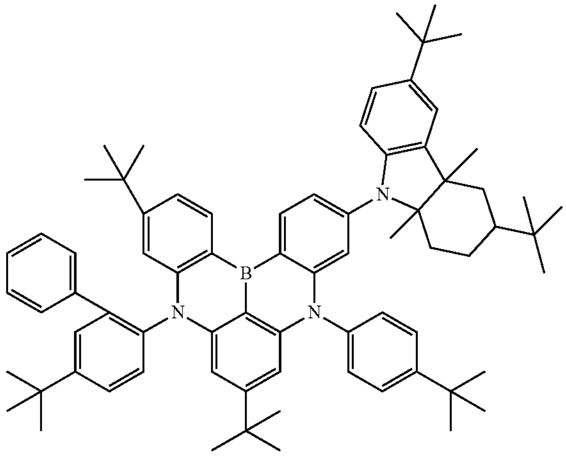
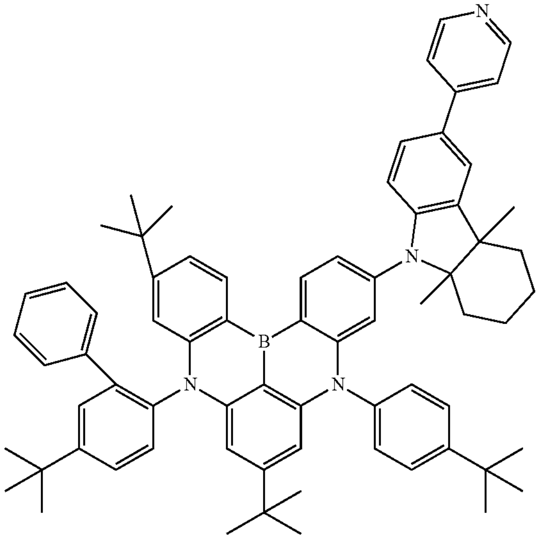
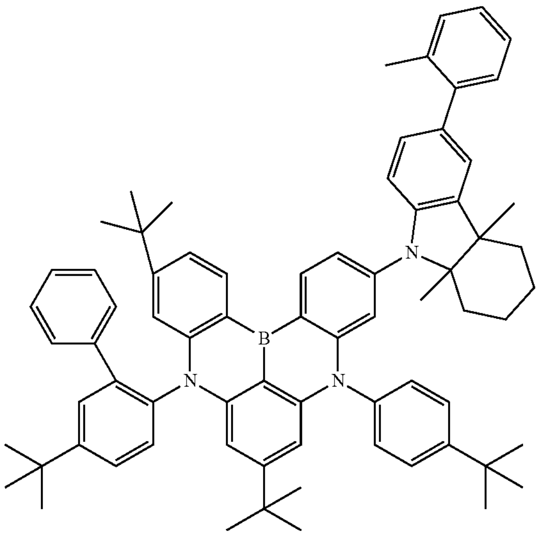

-continued
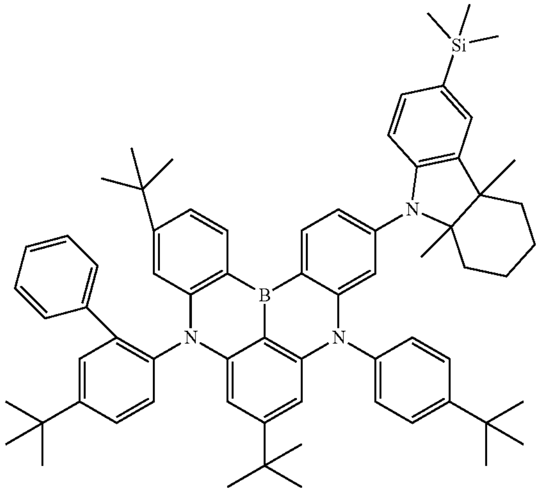
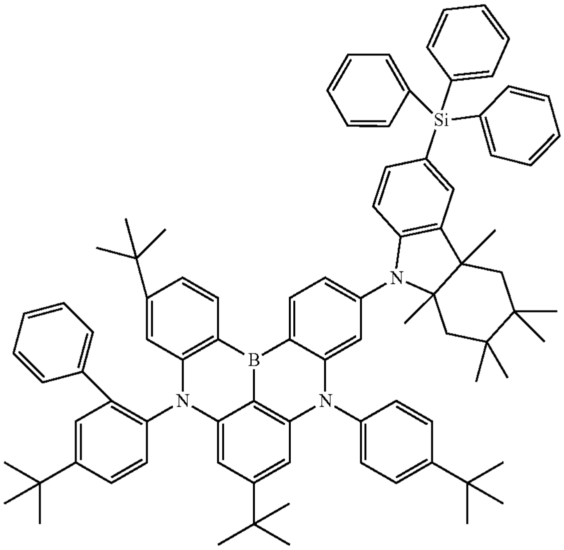
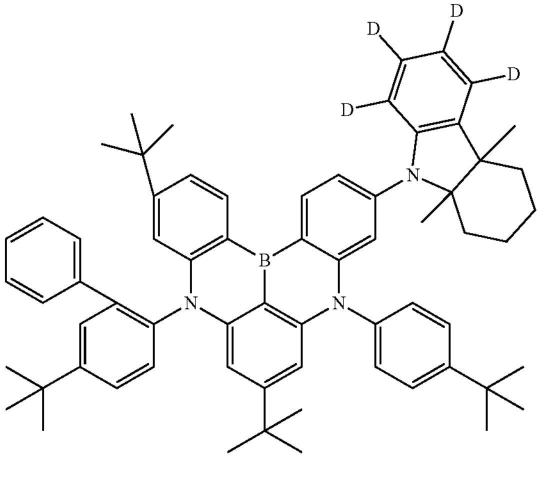
-continued
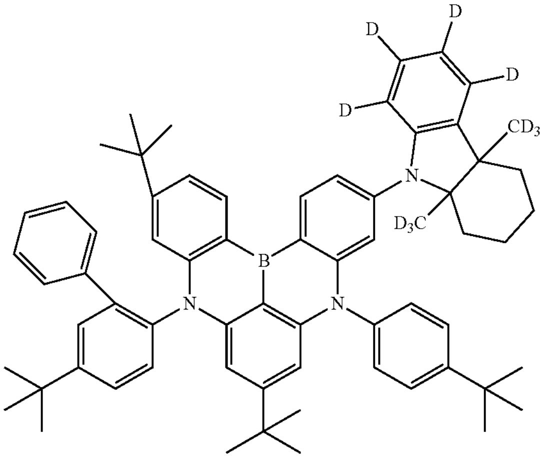
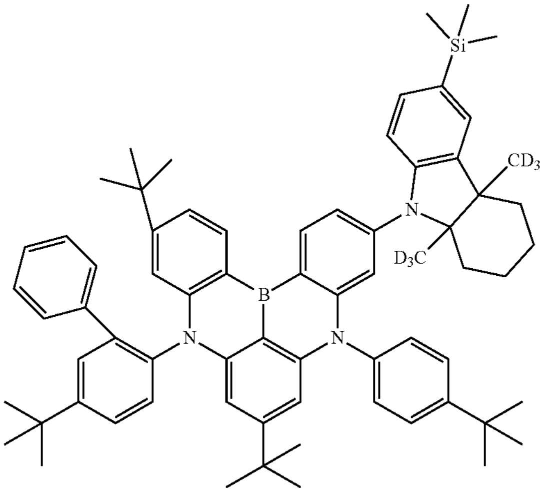
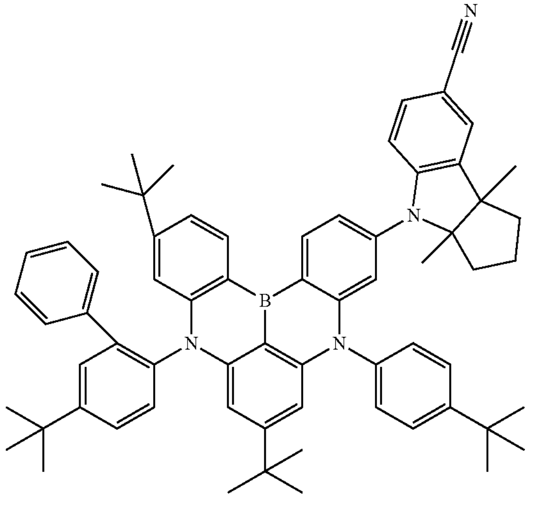

-continued
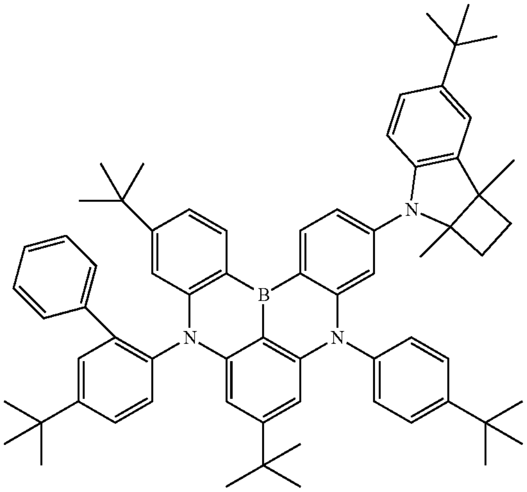
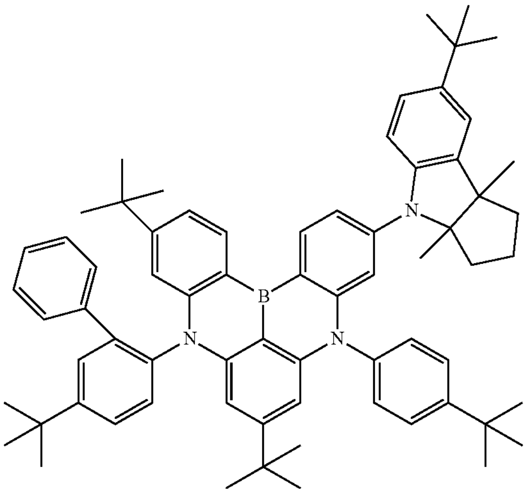
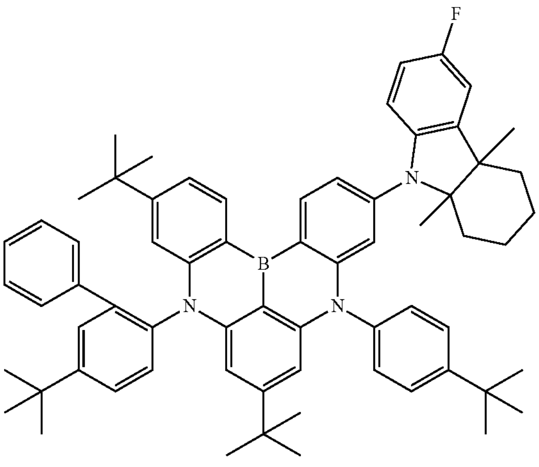
-continued
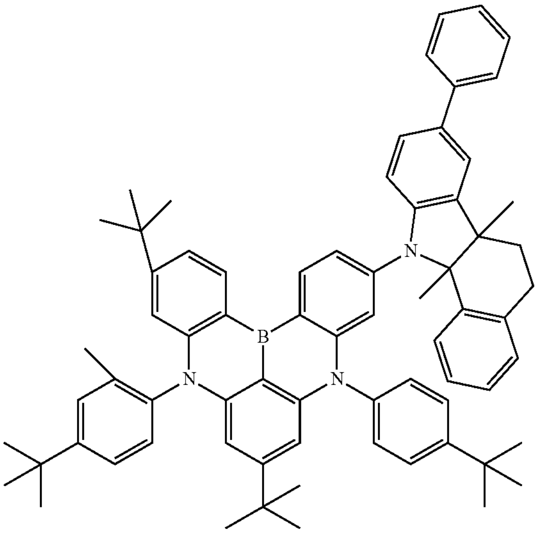
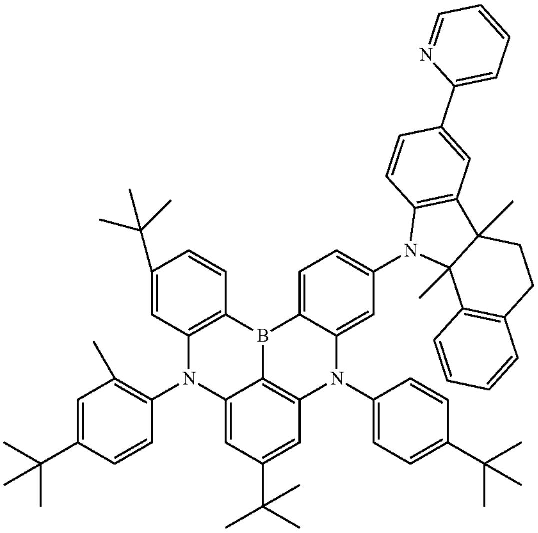
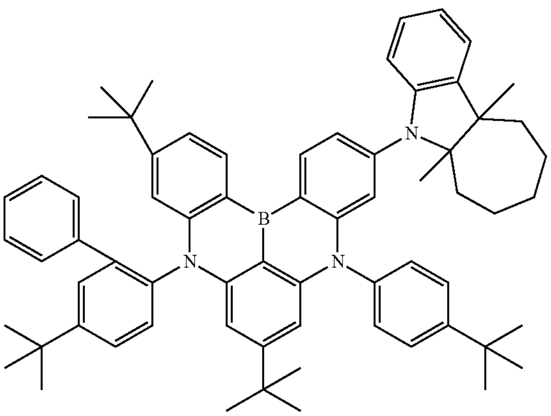

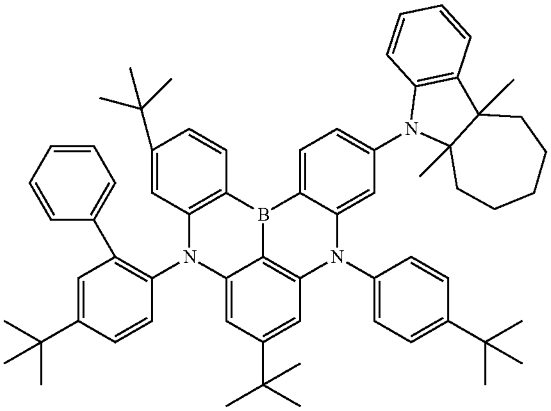
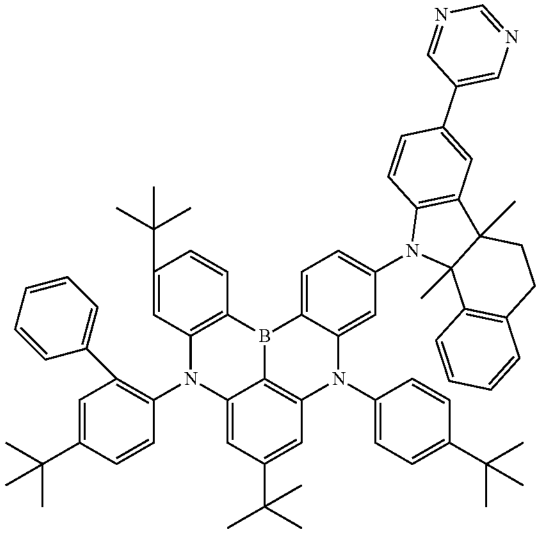
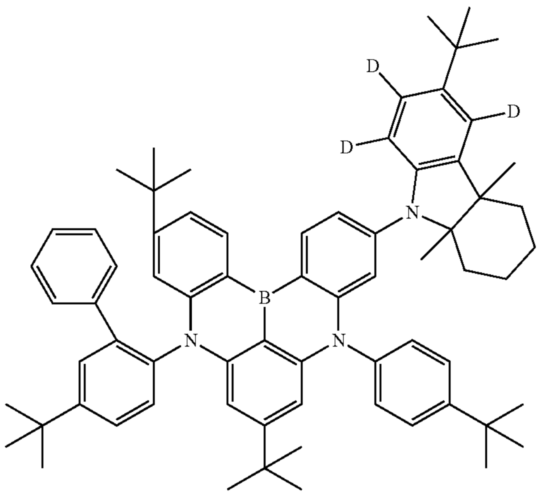
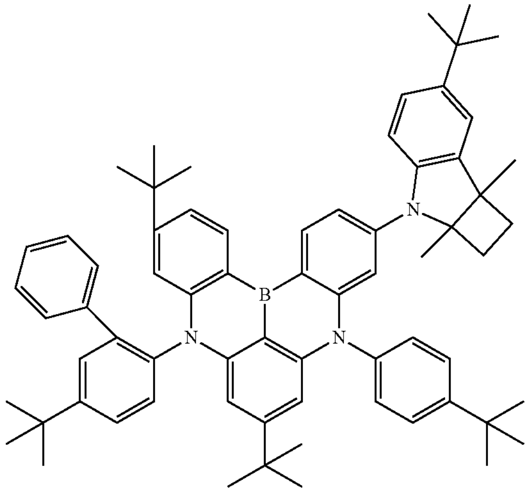
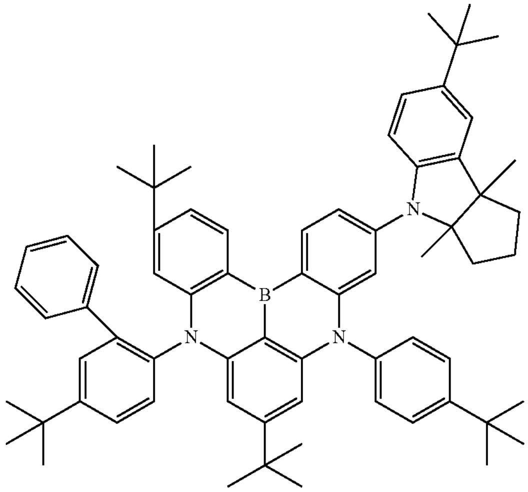
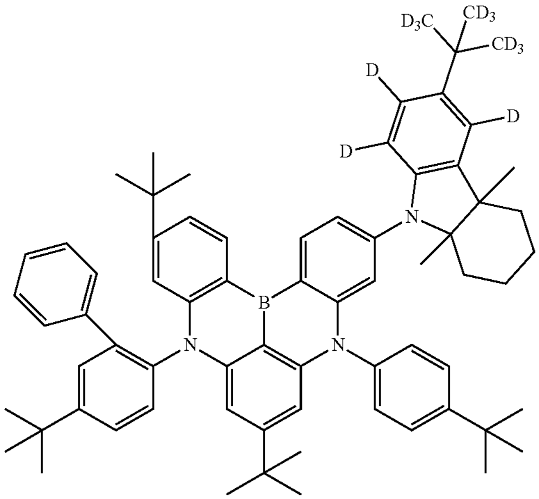

-continued
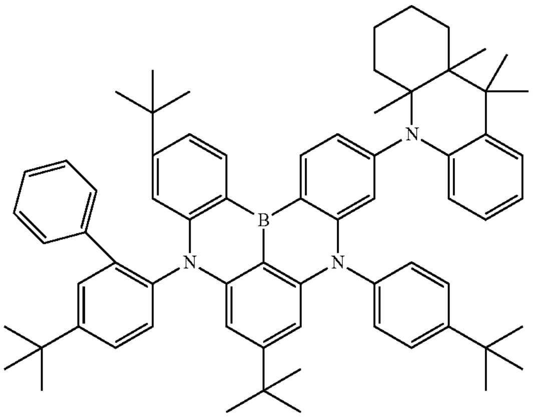
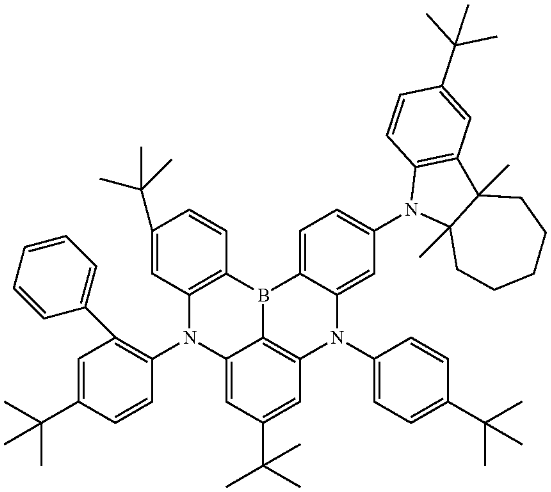
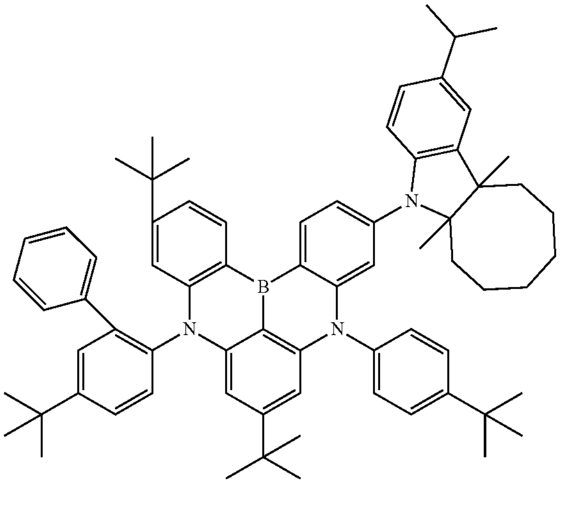
-continued
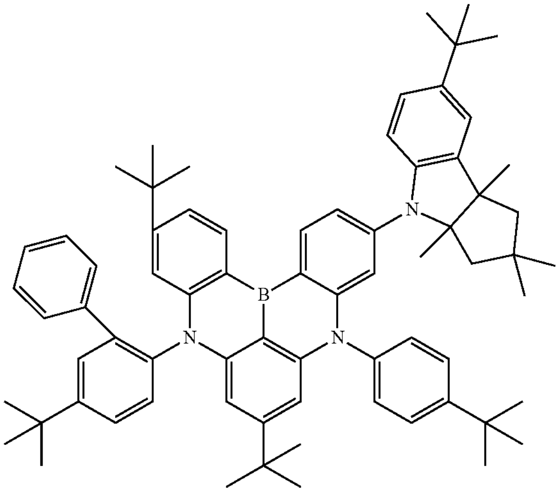
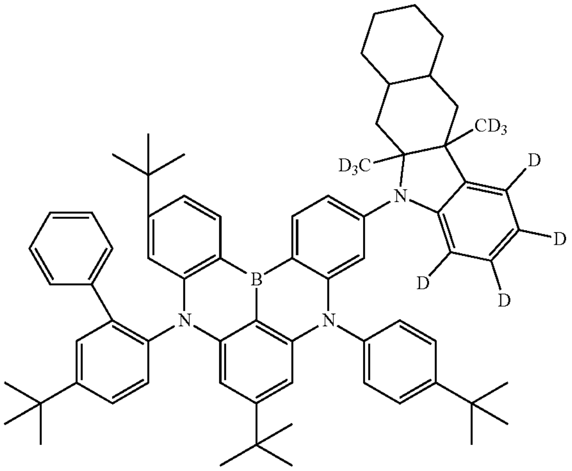
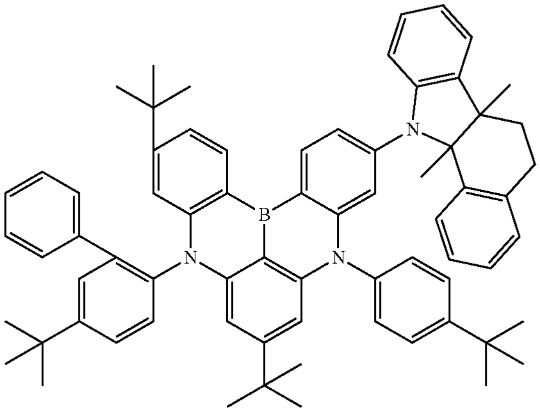

-continued
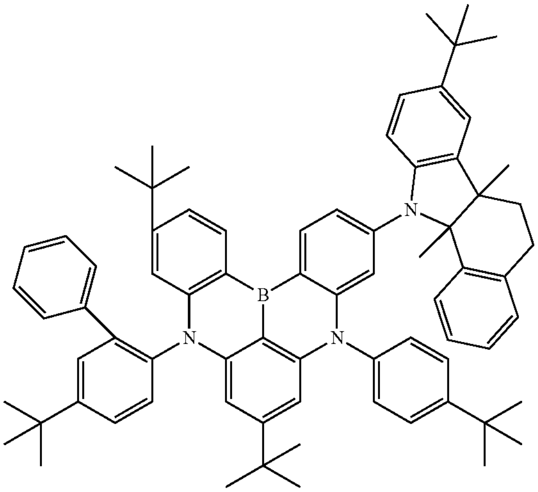
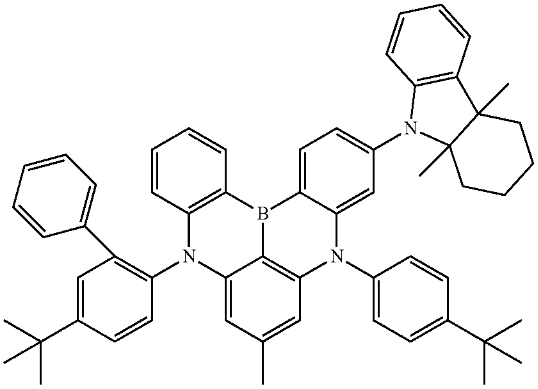
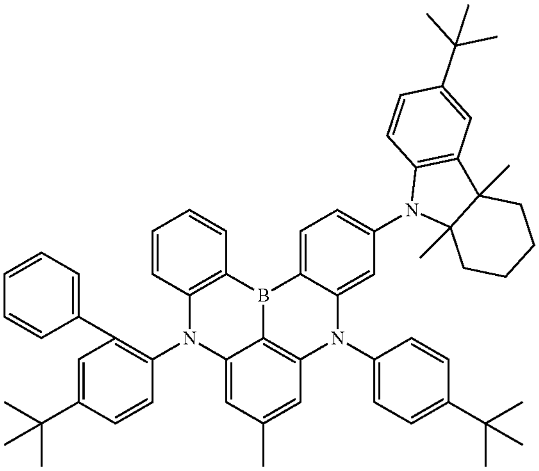
-continued
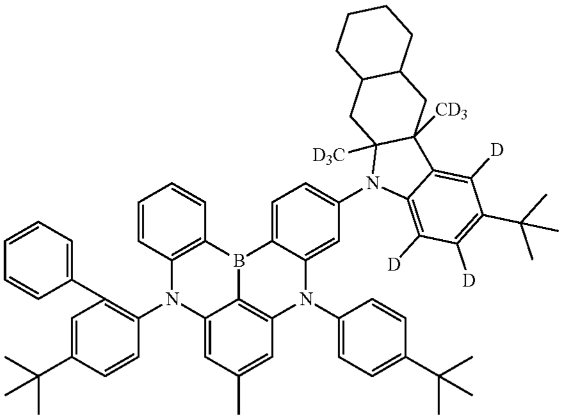
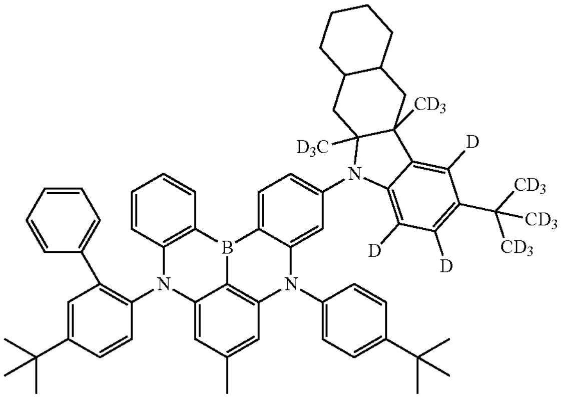
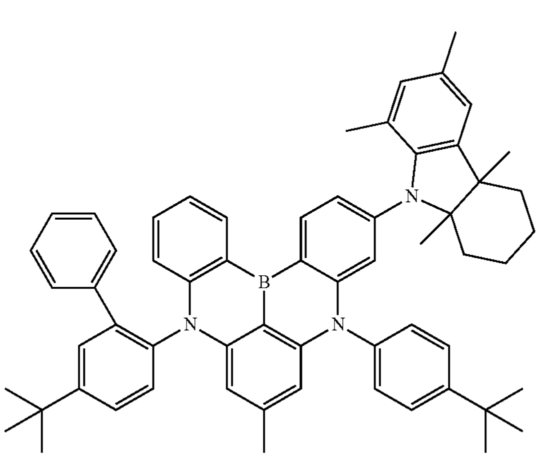

-continued
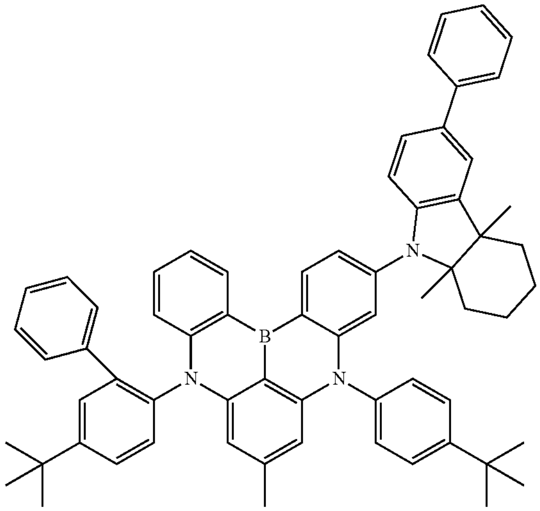
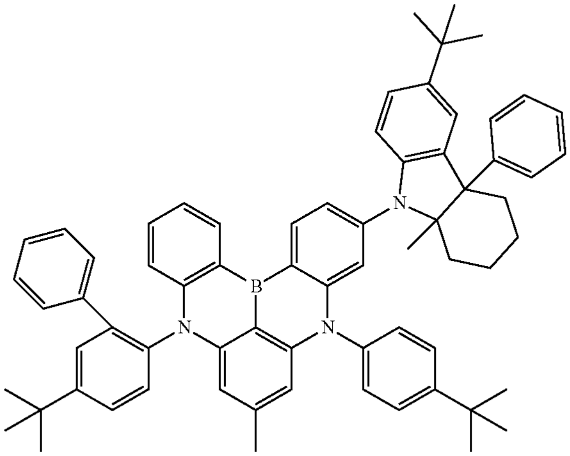
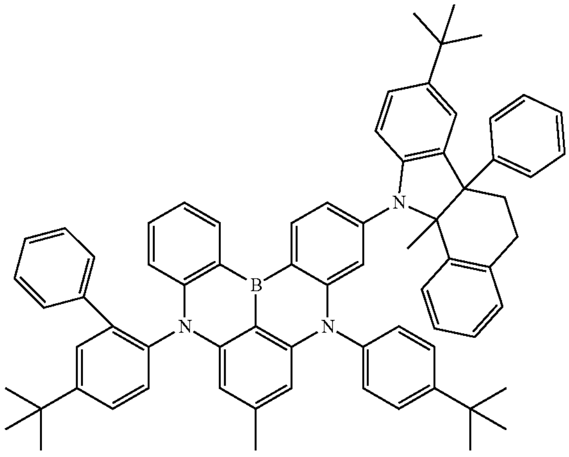
-continued
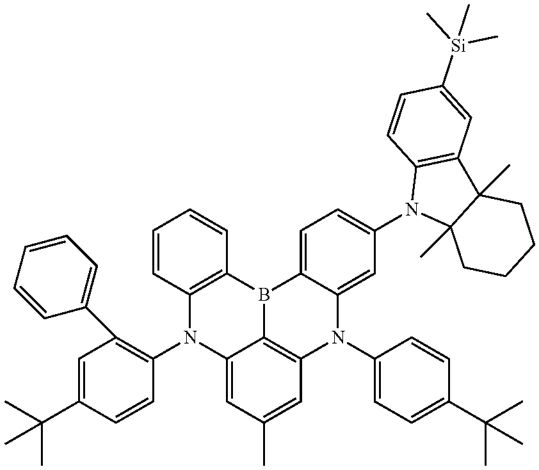
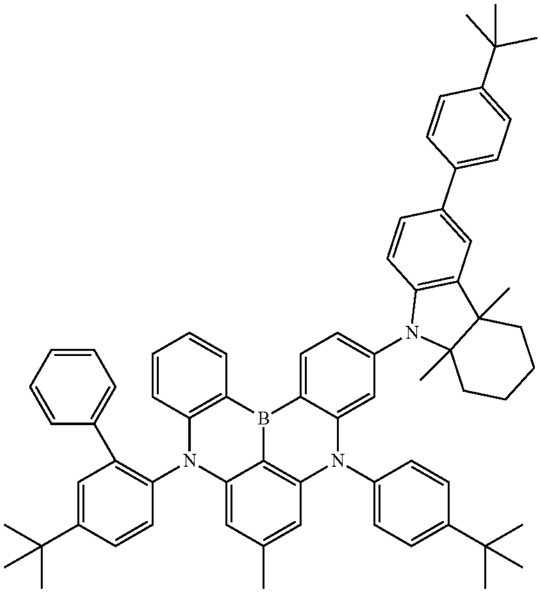
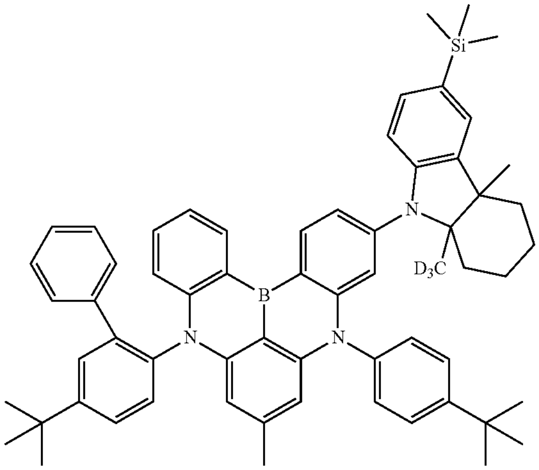

-continued
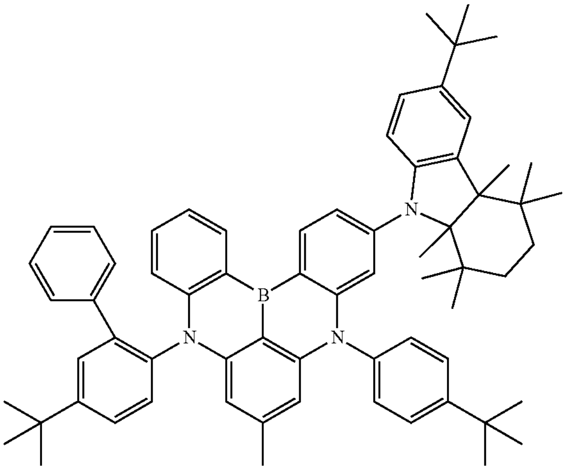
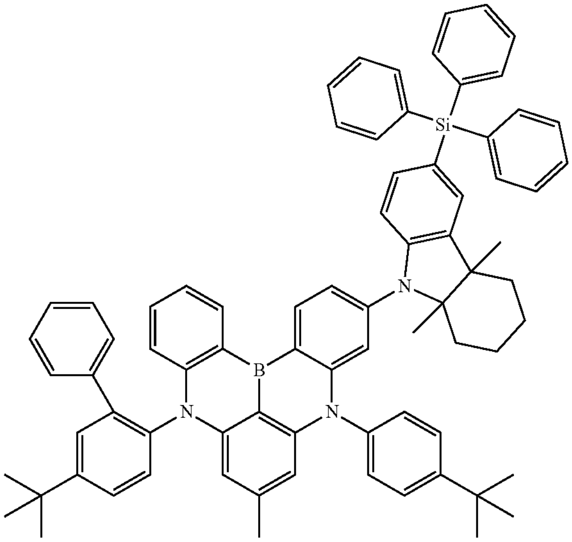
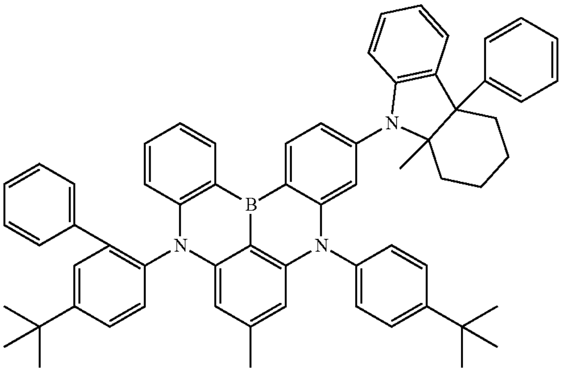
-continued
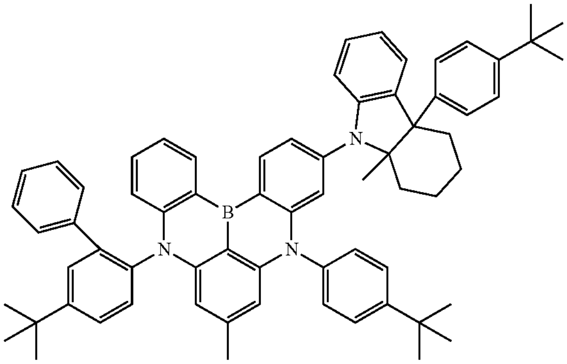
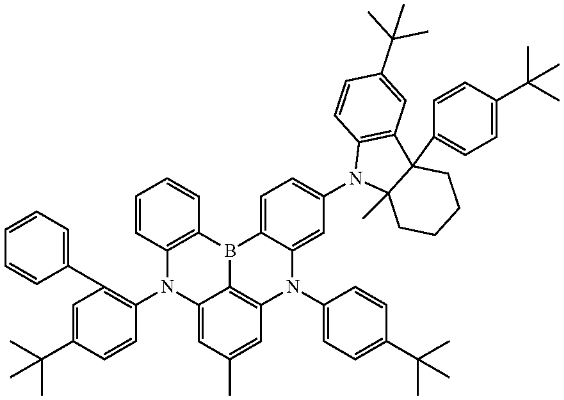
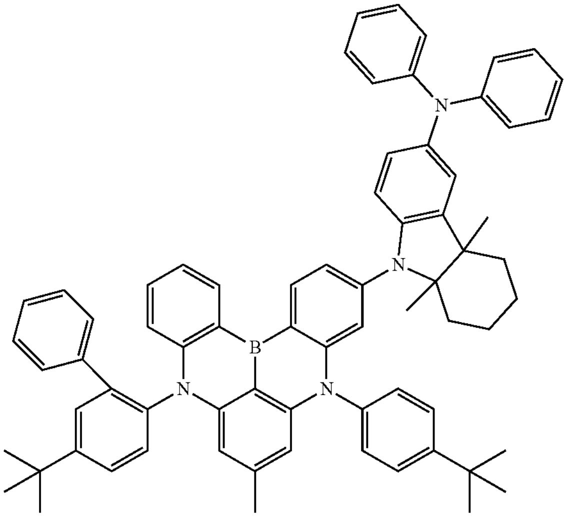
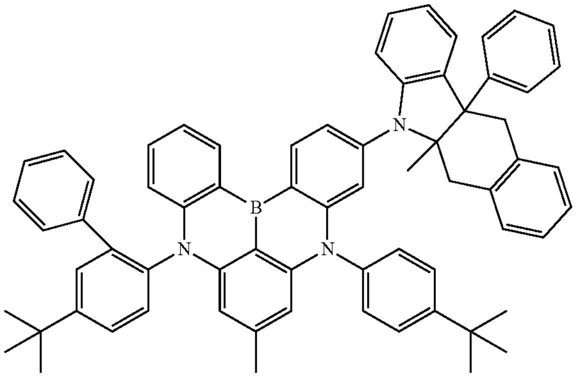

-continued
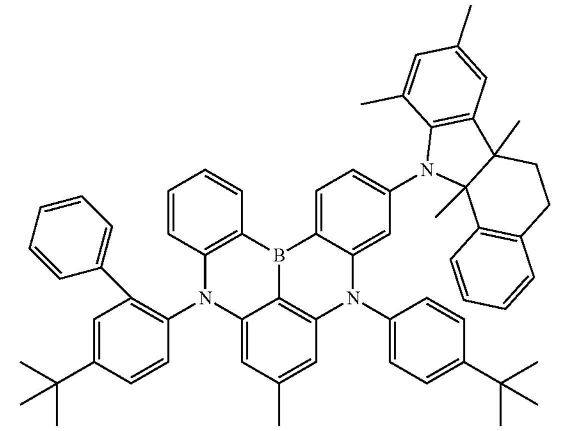
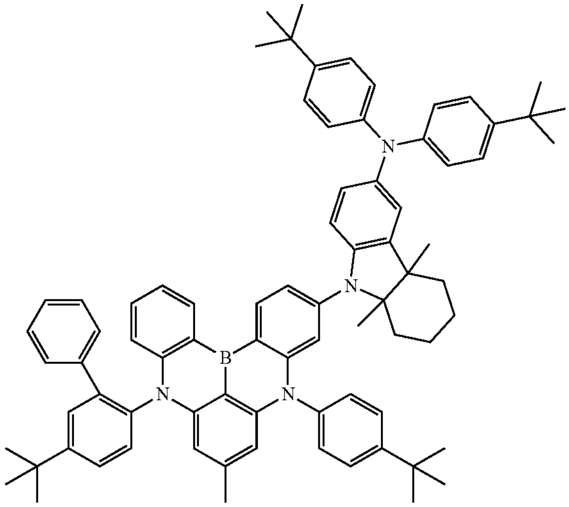
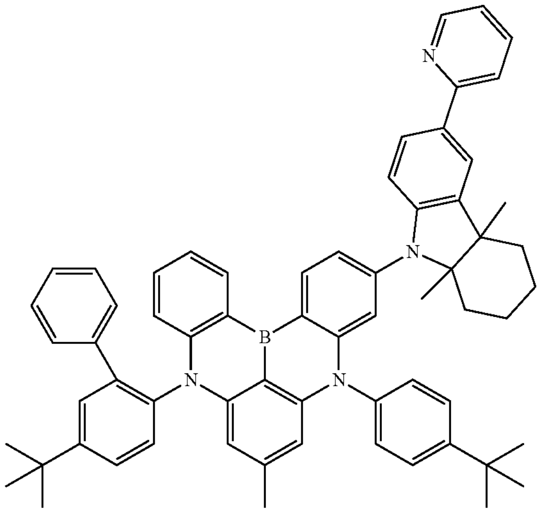
-continued
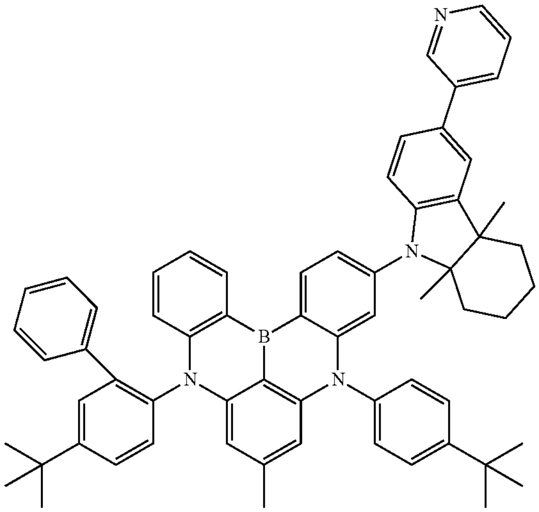
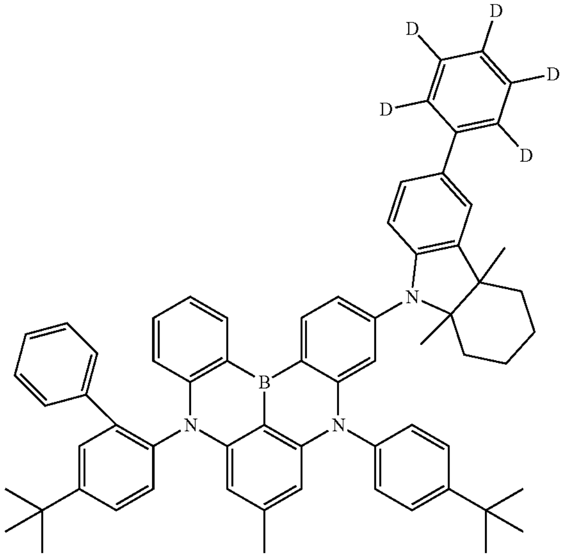
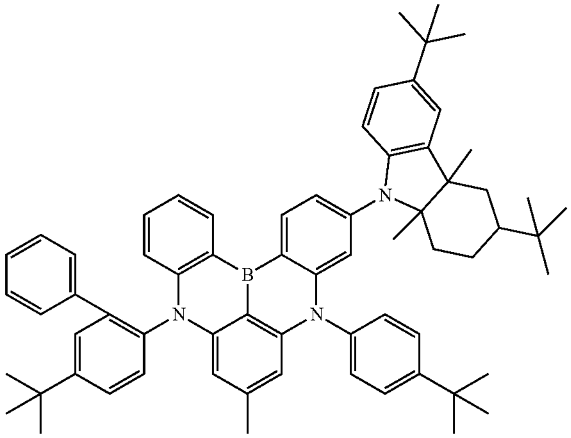

-continued
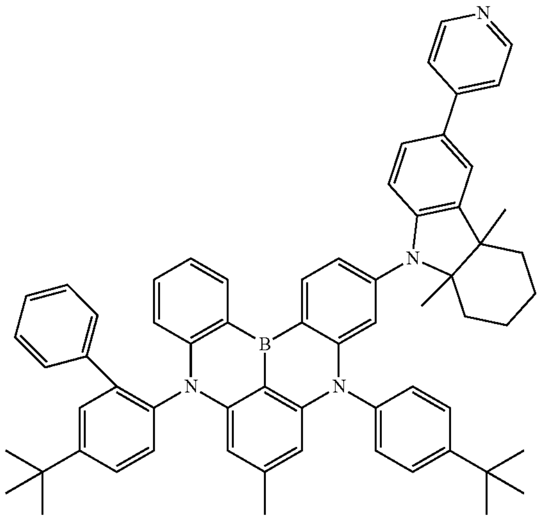
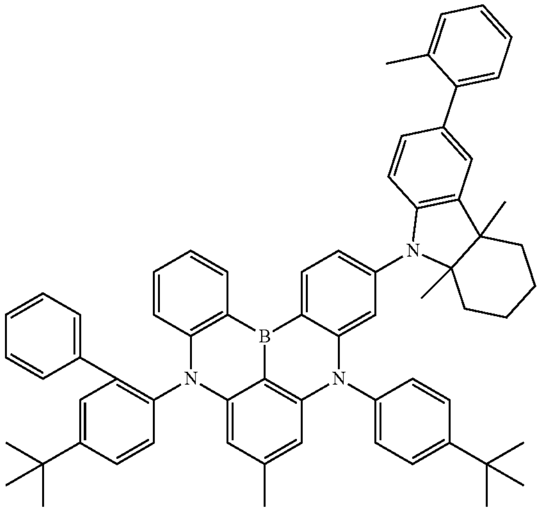
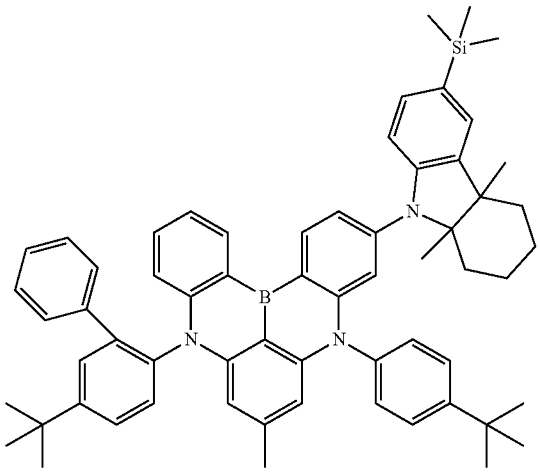
-continued
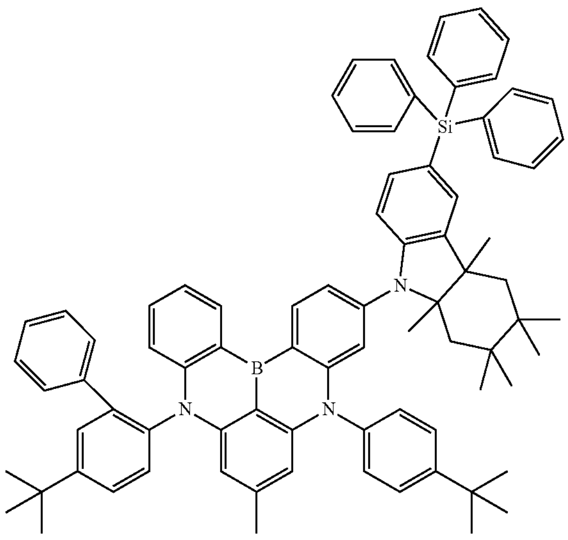
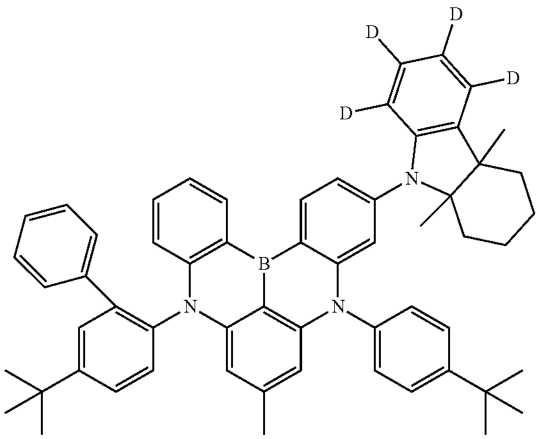
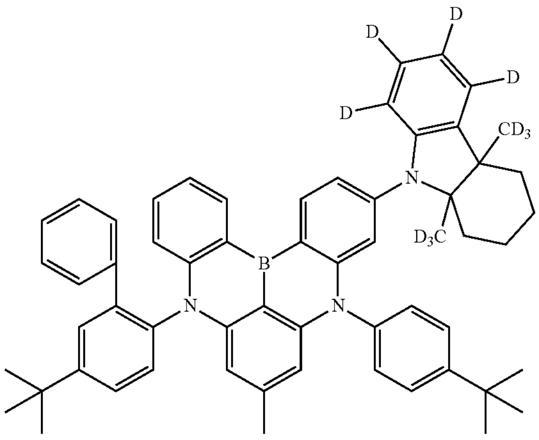

-continued
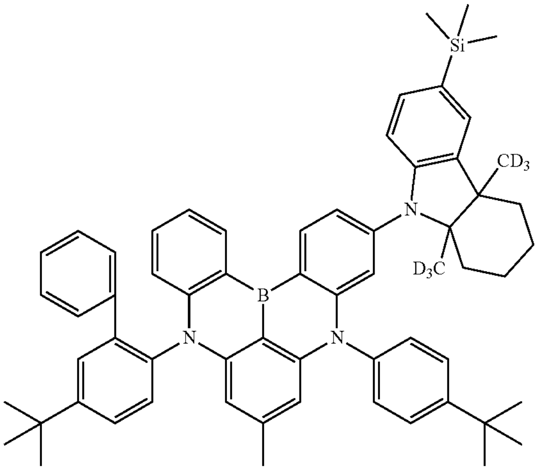
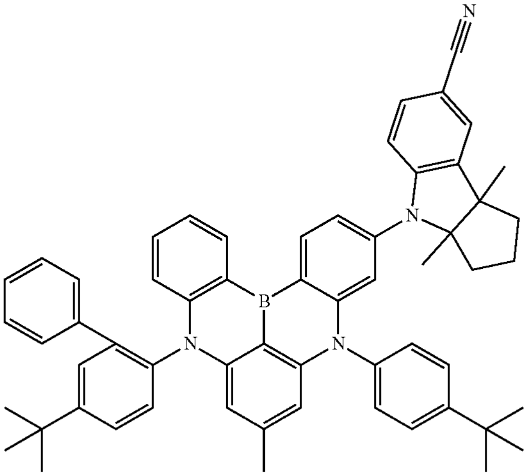
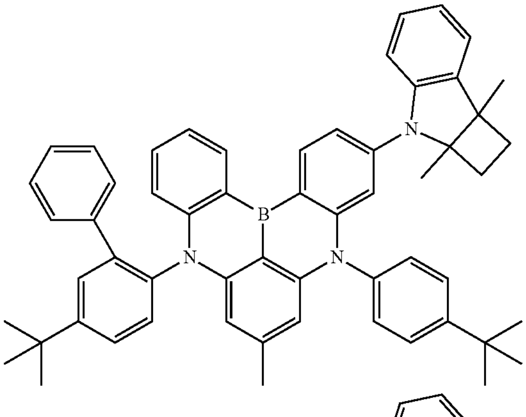
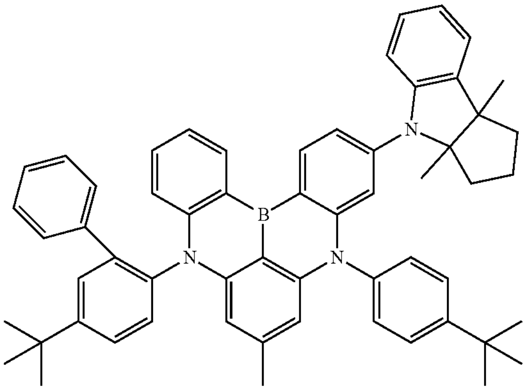
-continued
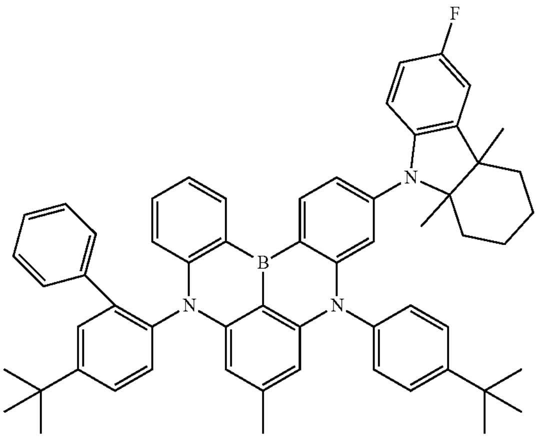
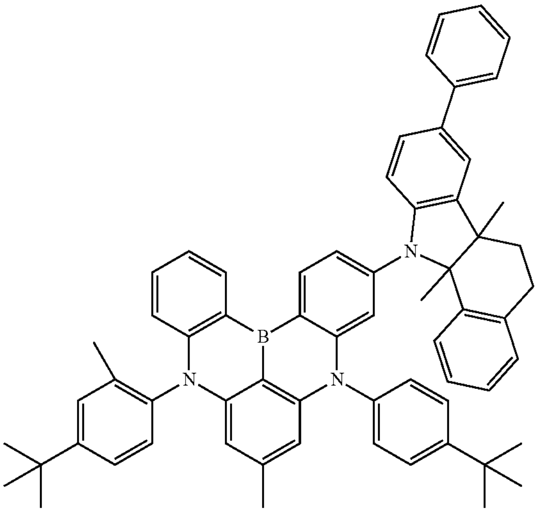
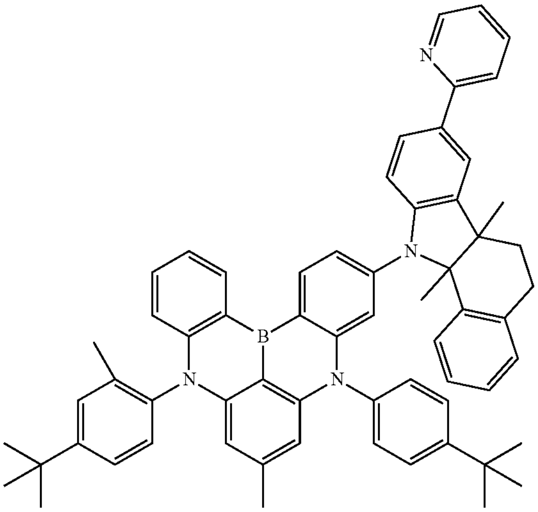

-continued
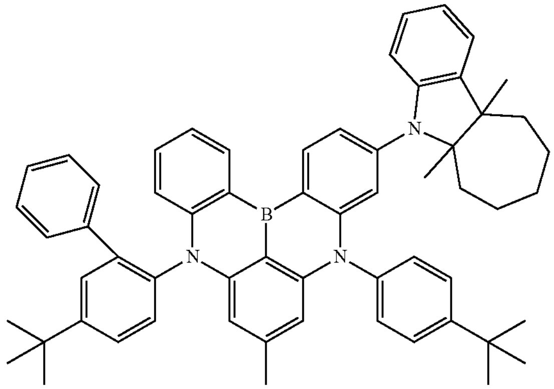
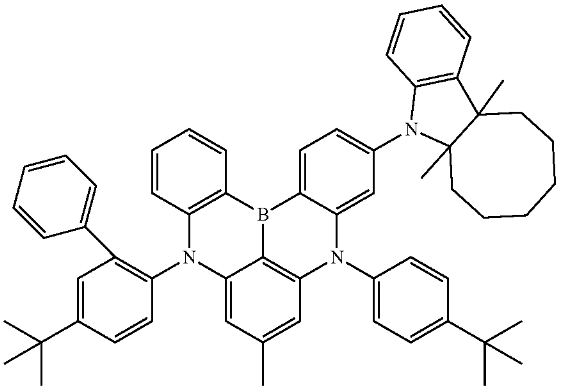
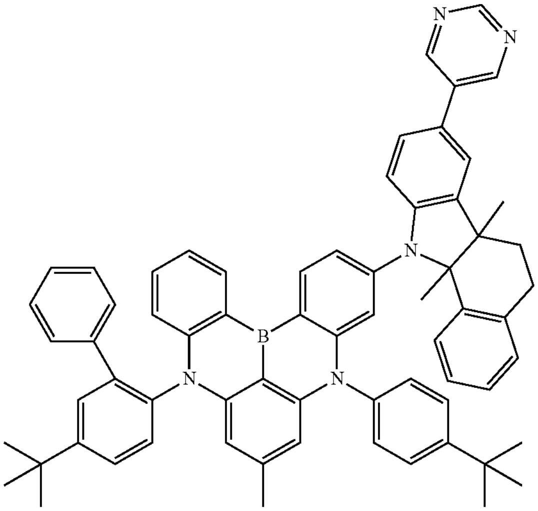
-continued
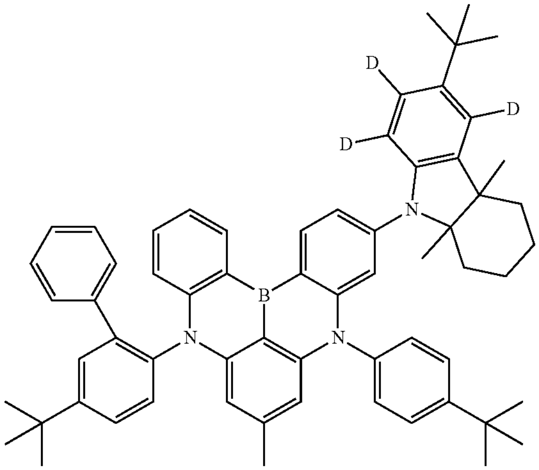
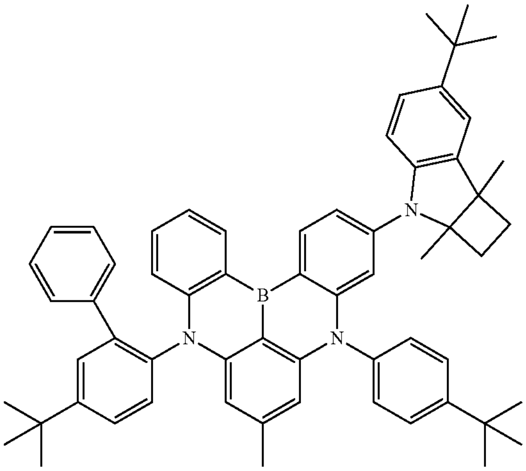
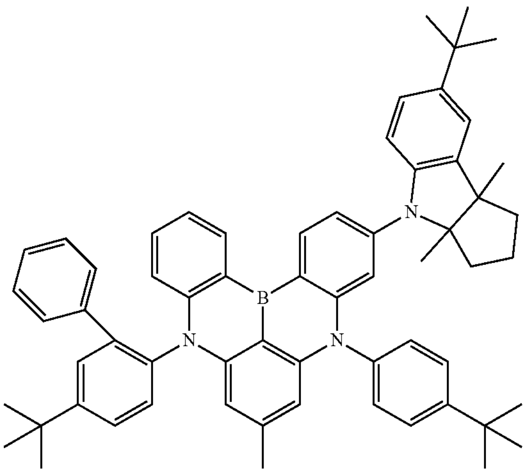

-continued
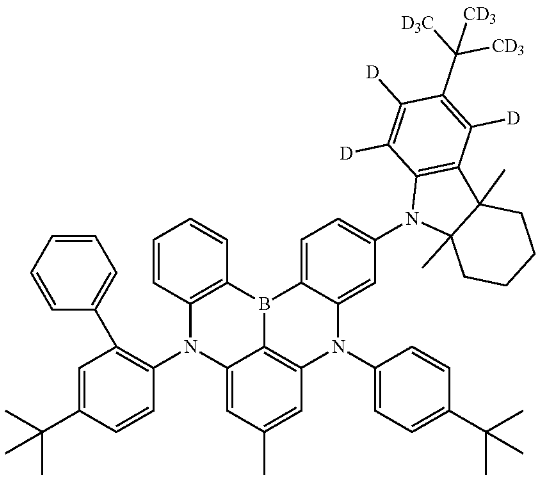
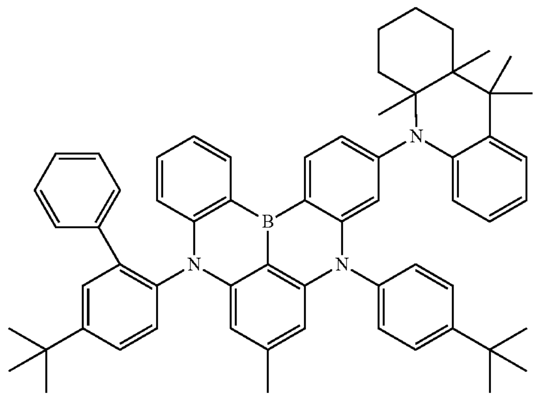
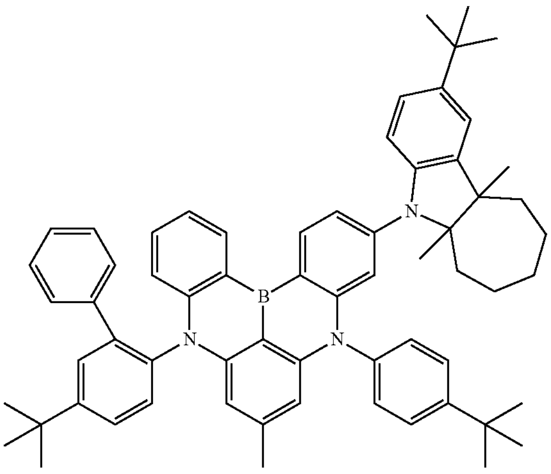
-continued
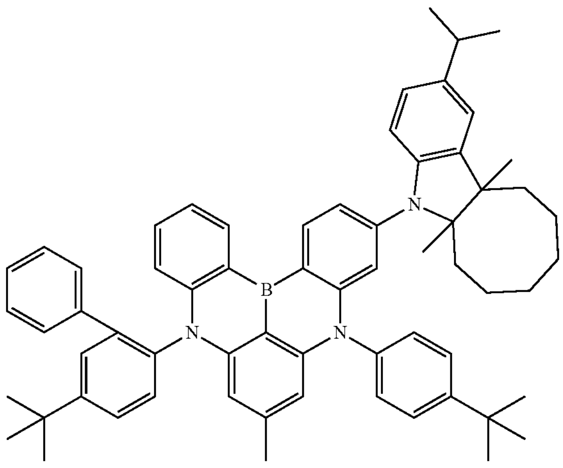
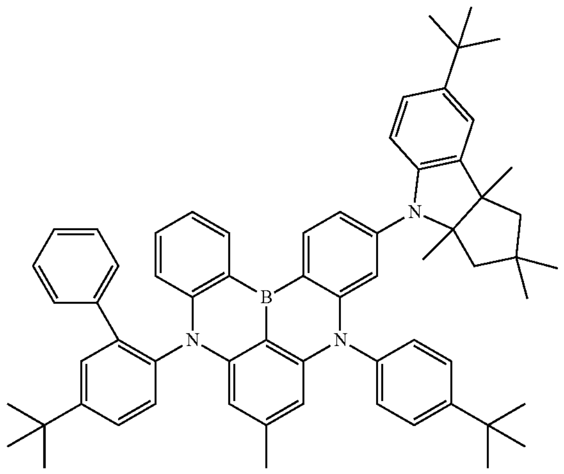
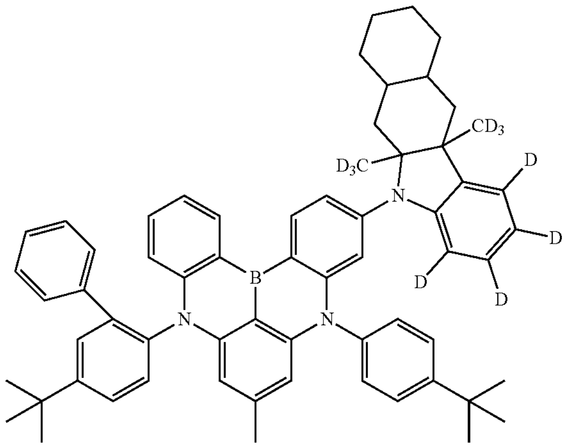

-continued
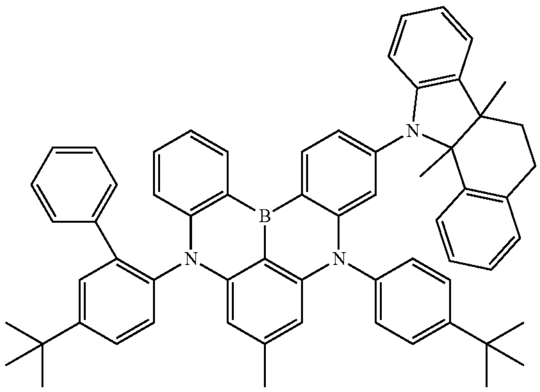
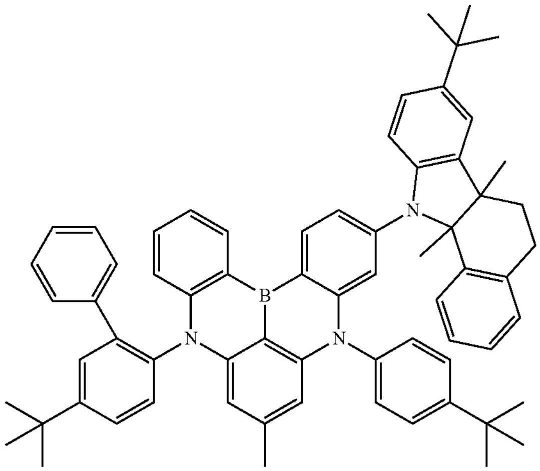
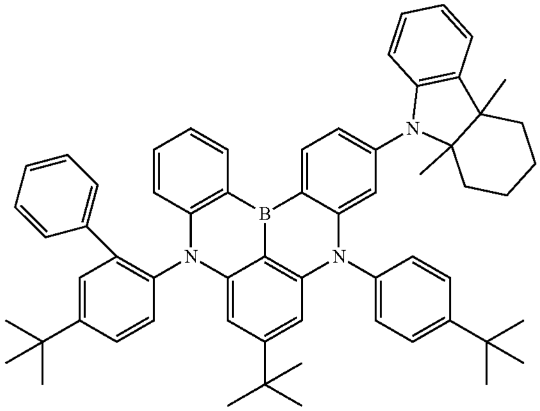
-continued
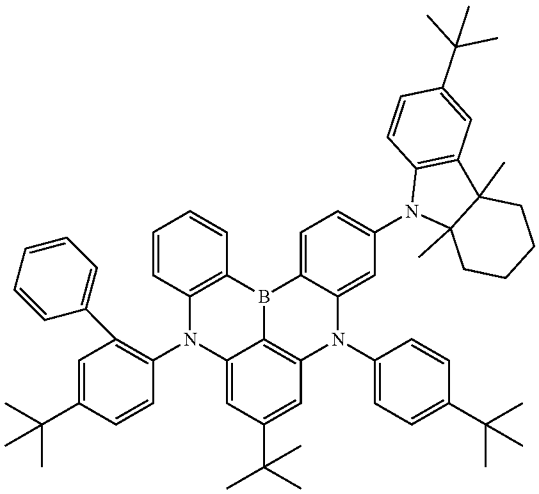
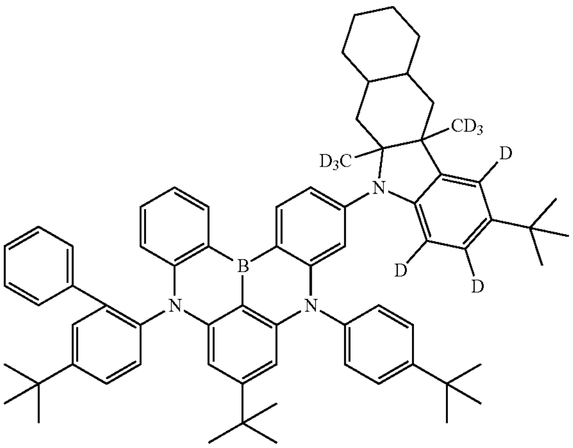
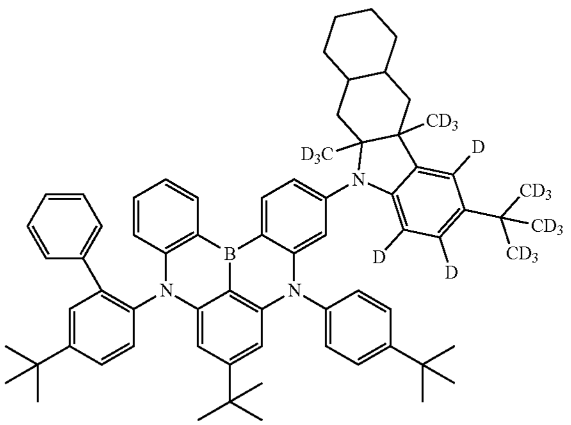

-continued
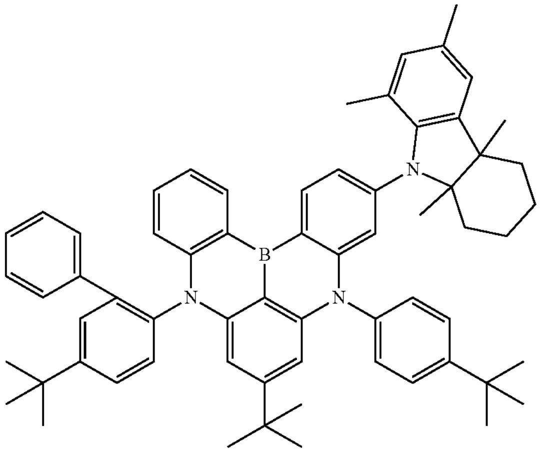
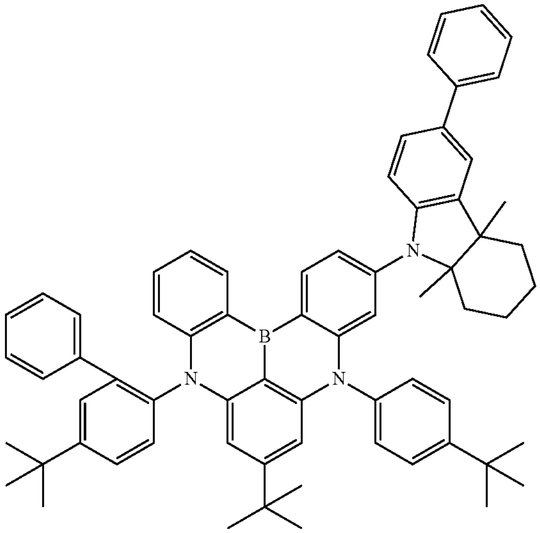
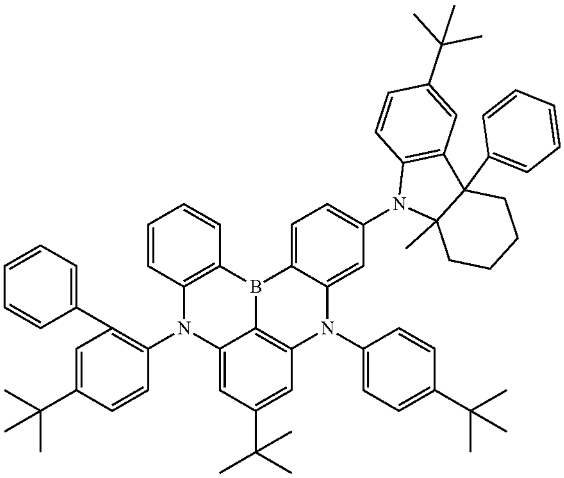
-continued
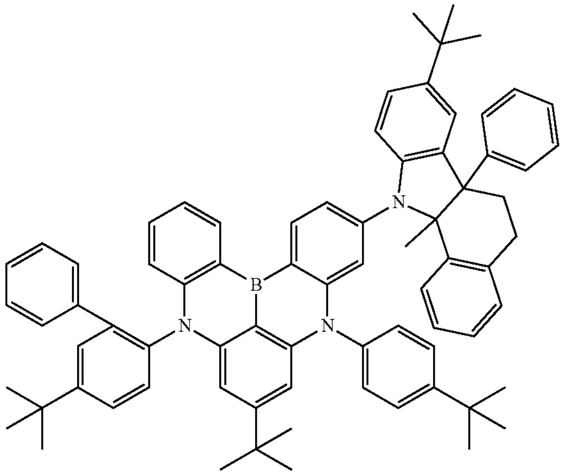
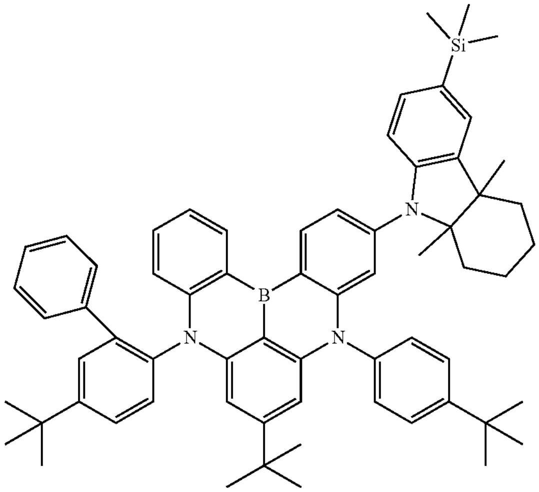
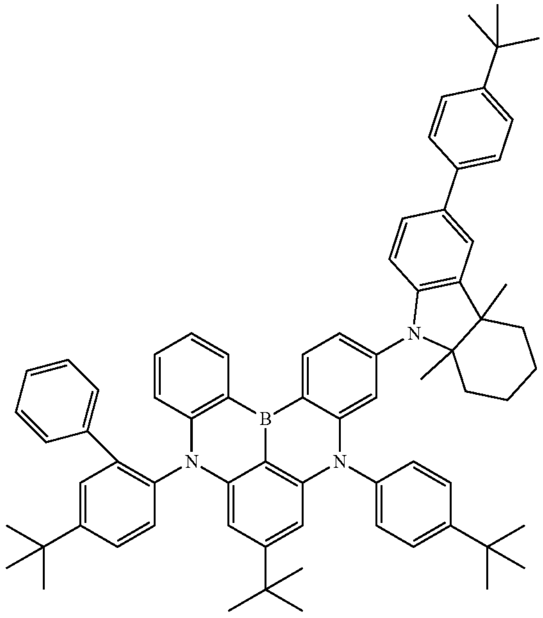

-continued
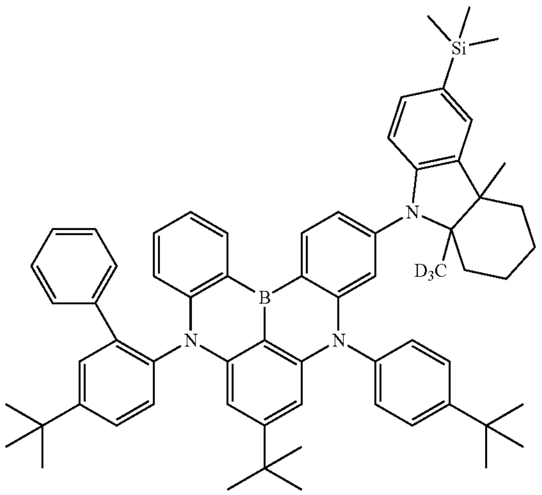
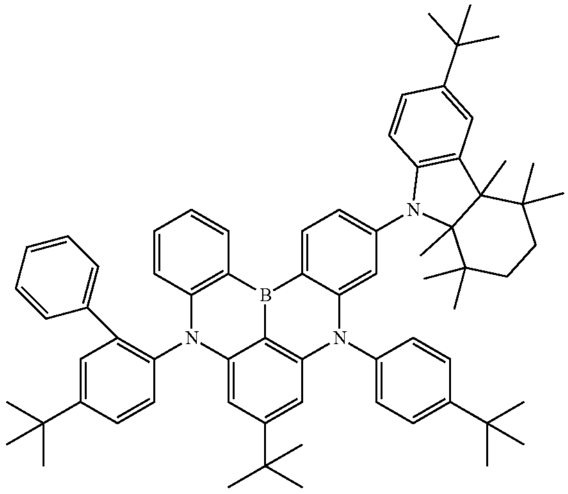
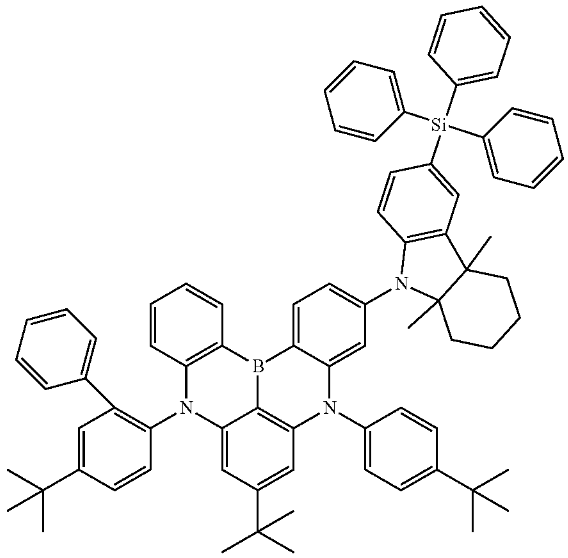
-continued
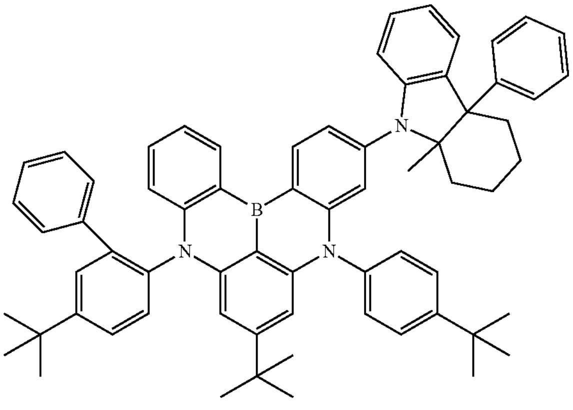
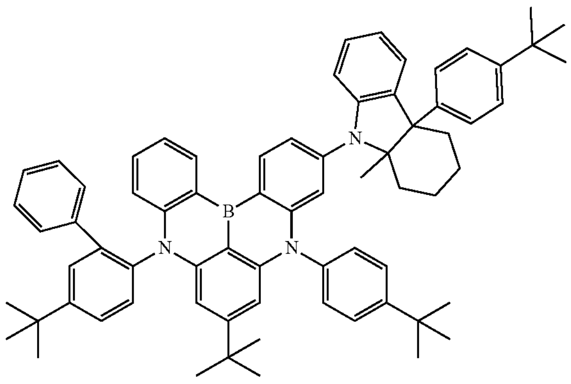
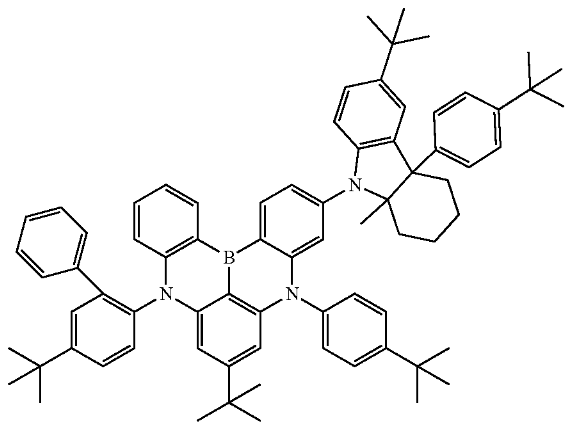

-continued
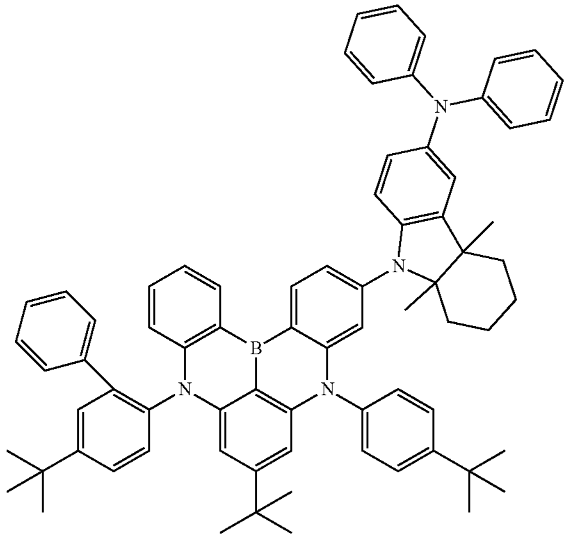
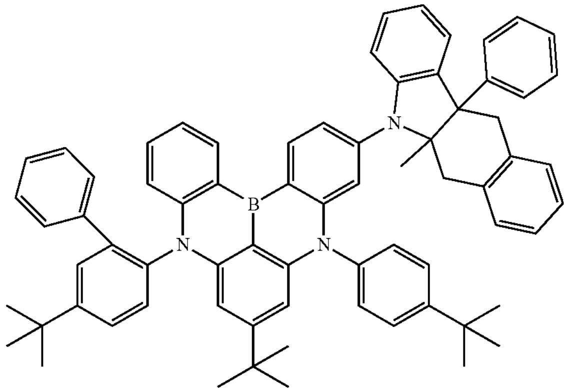
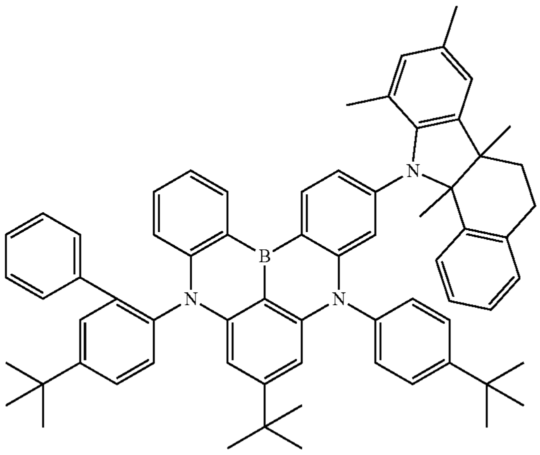
-continued
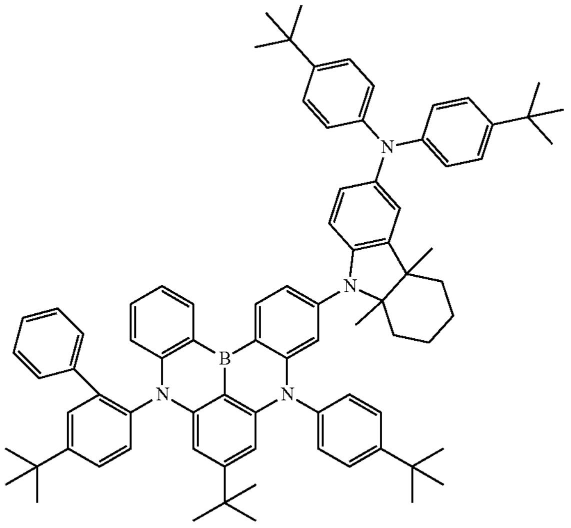
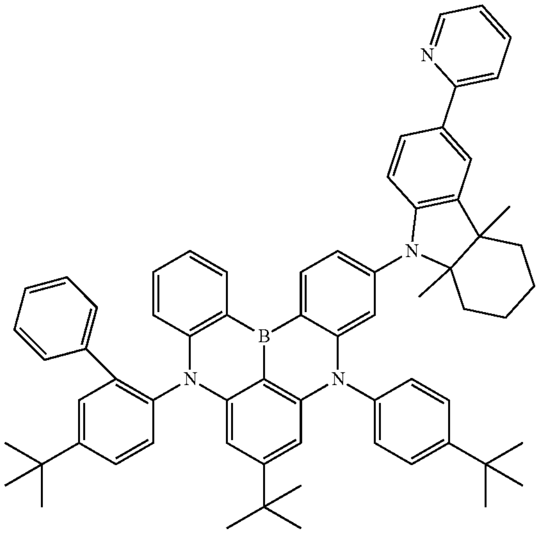
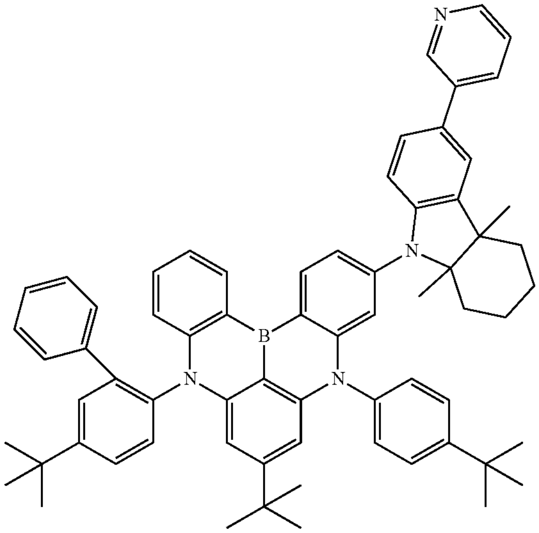

-continued
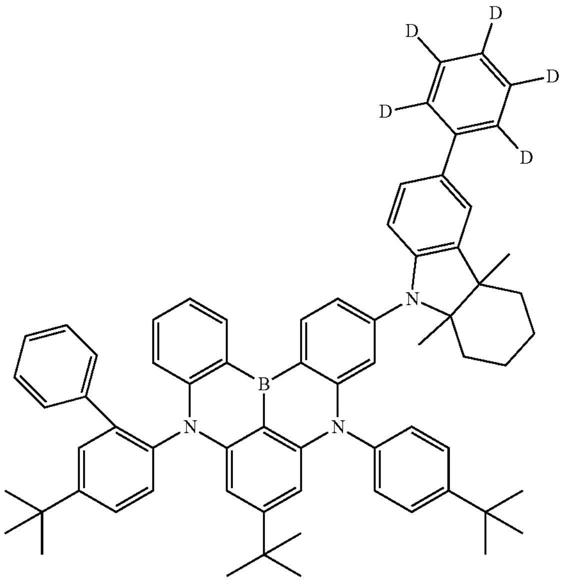
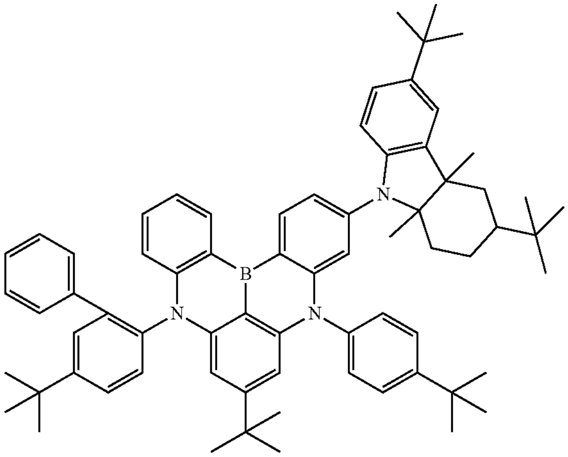
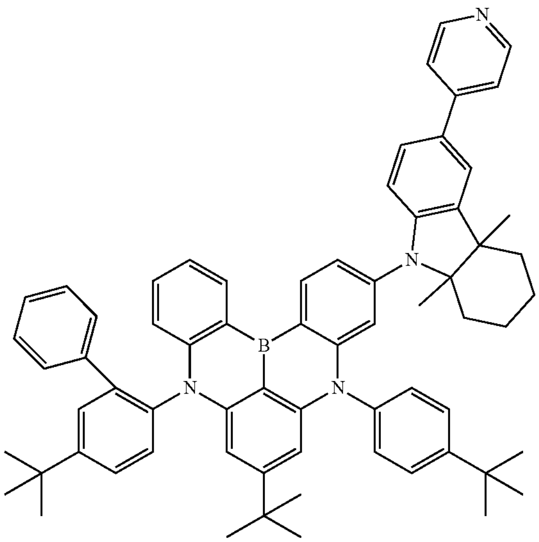
-continued
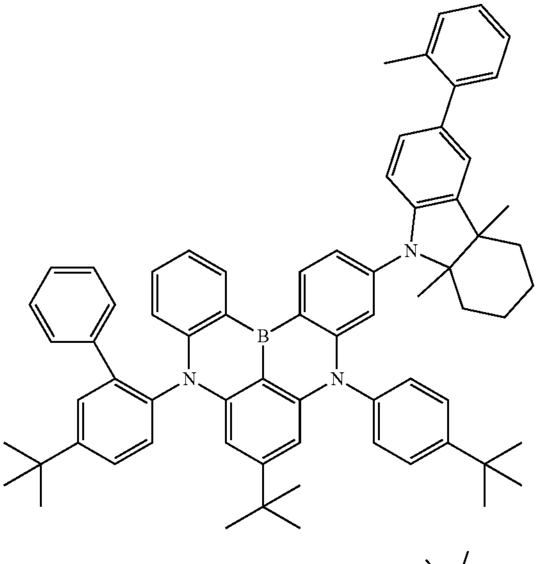
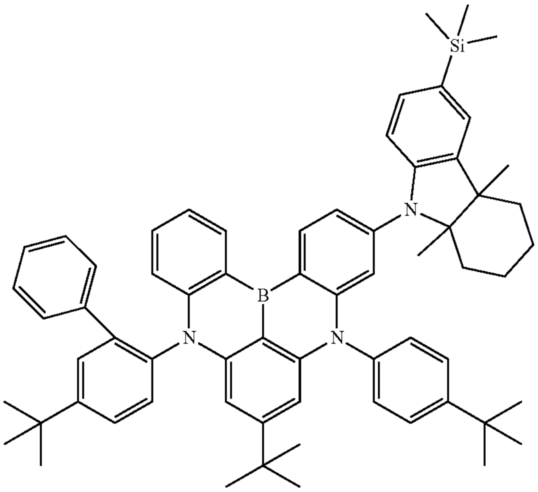
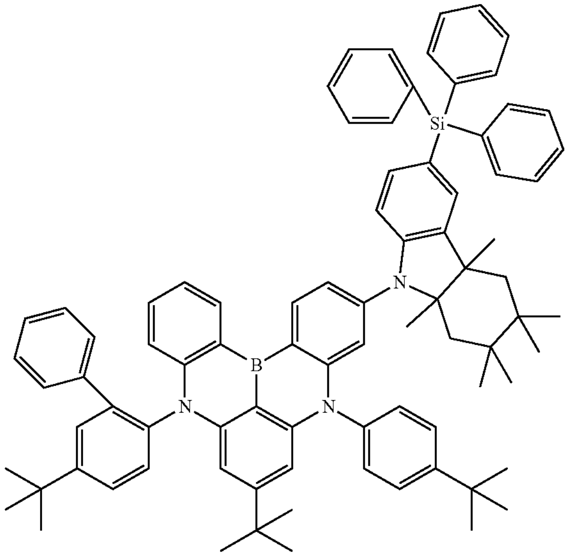

-continued
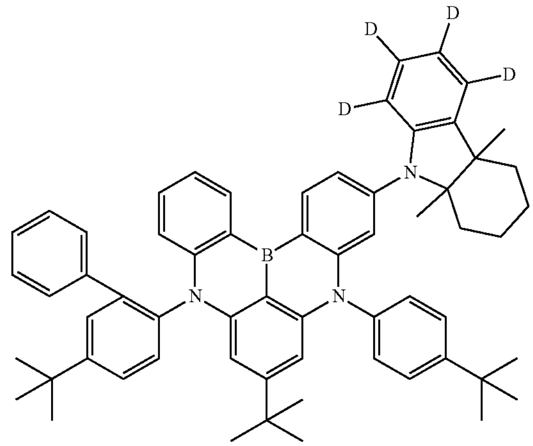
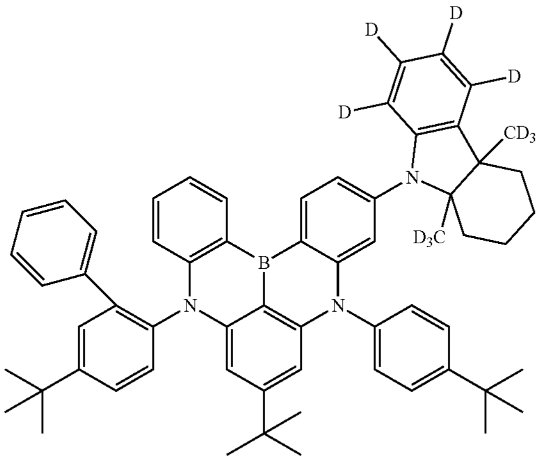
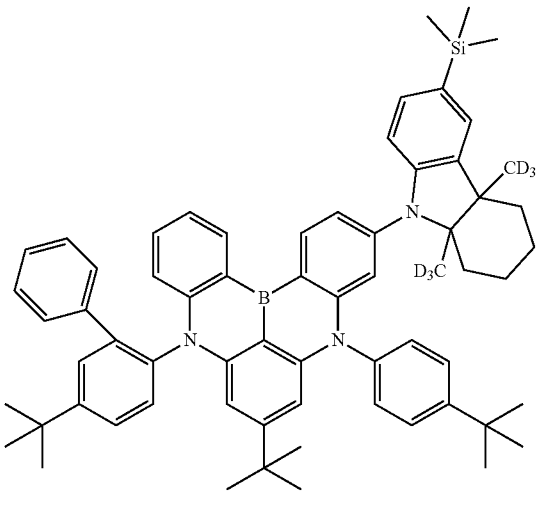
-continued
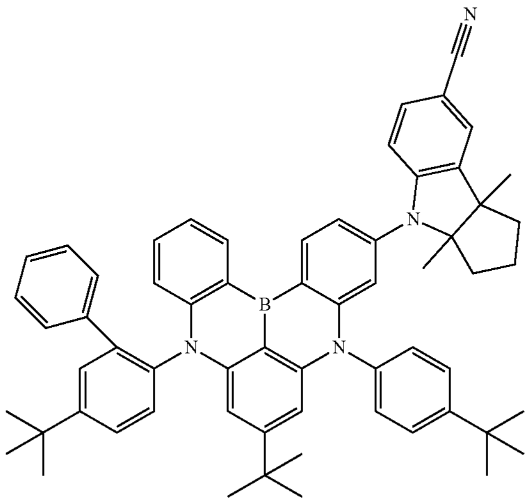
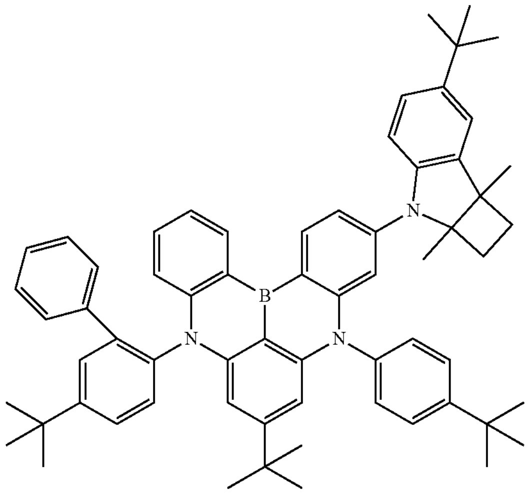
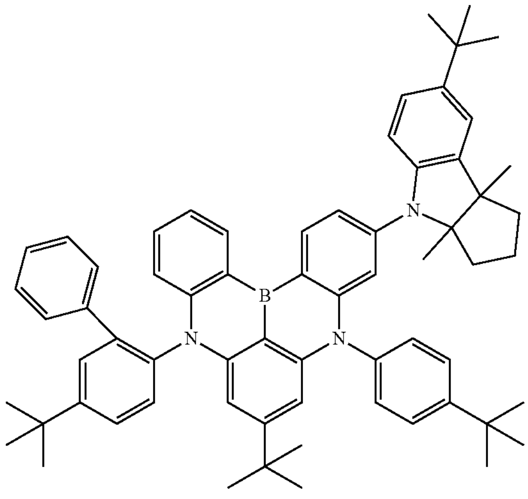

-continued
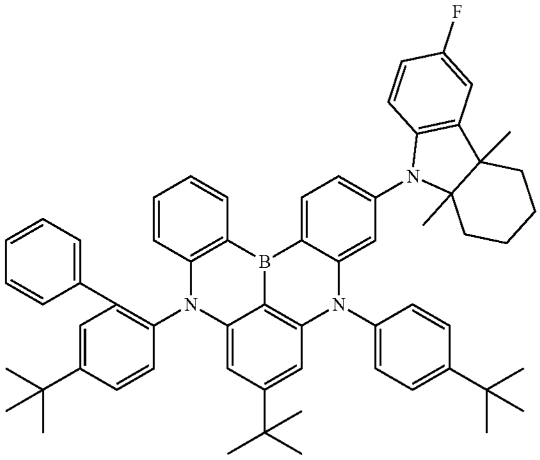
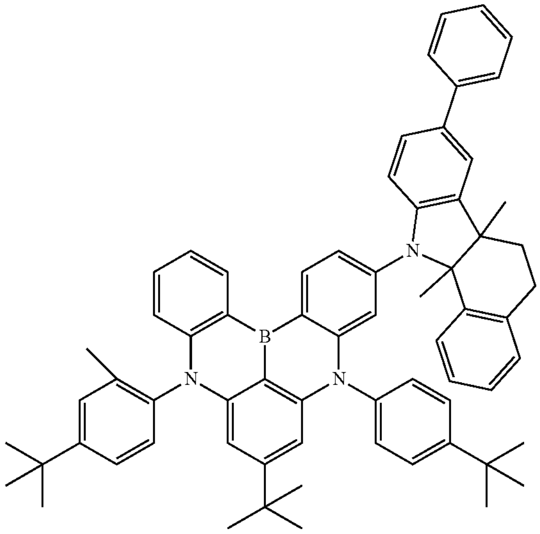
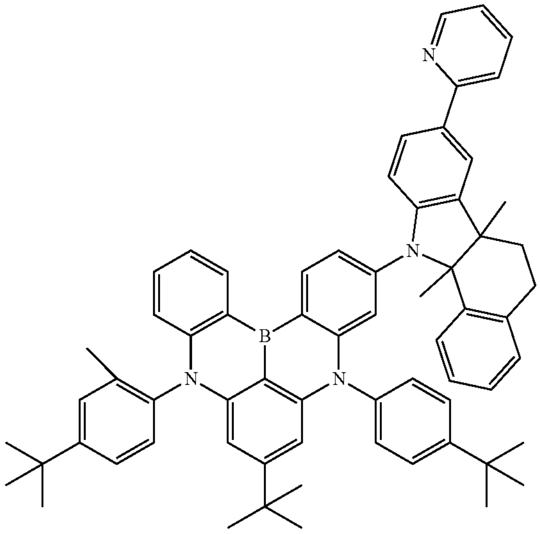
-continued
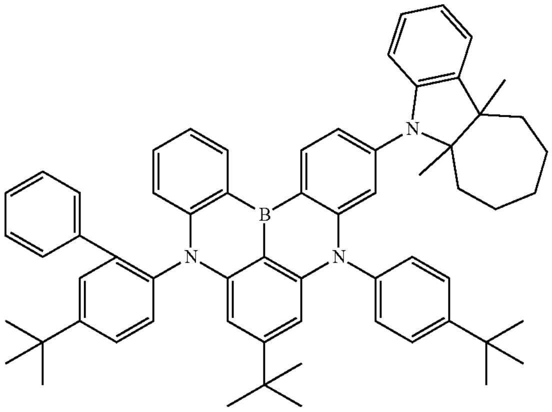
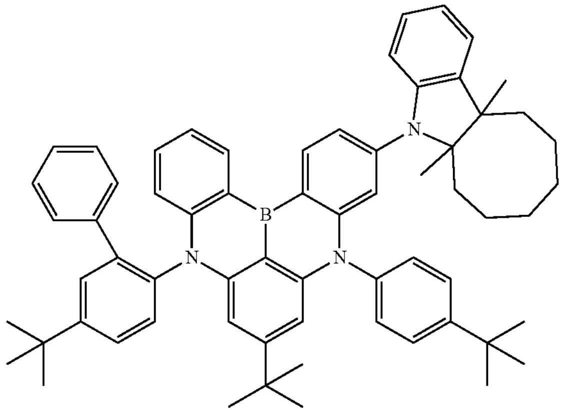
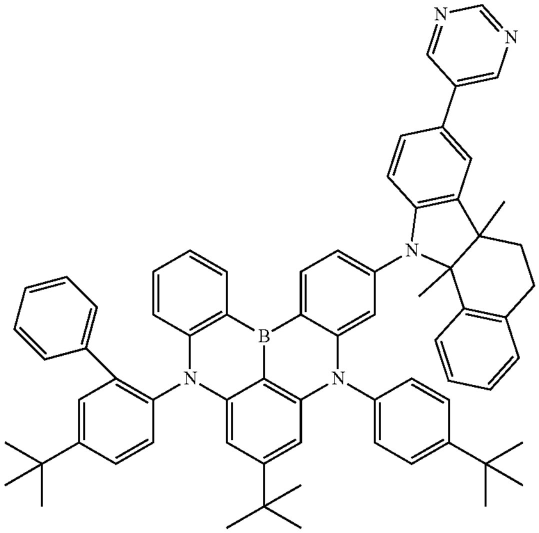

-continued
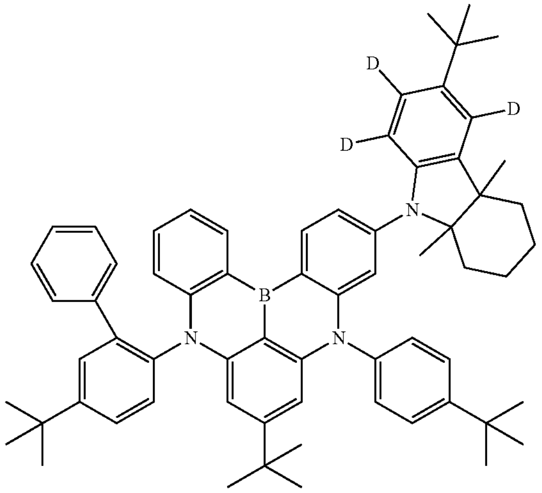
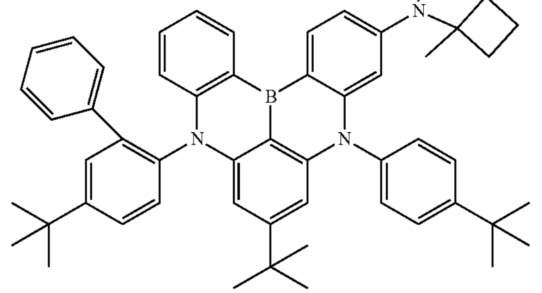
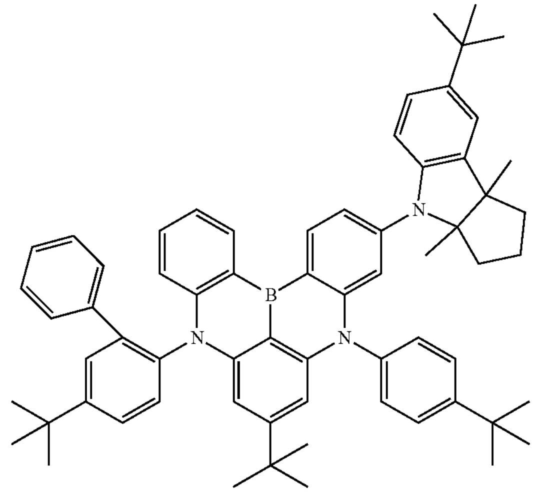
-continued
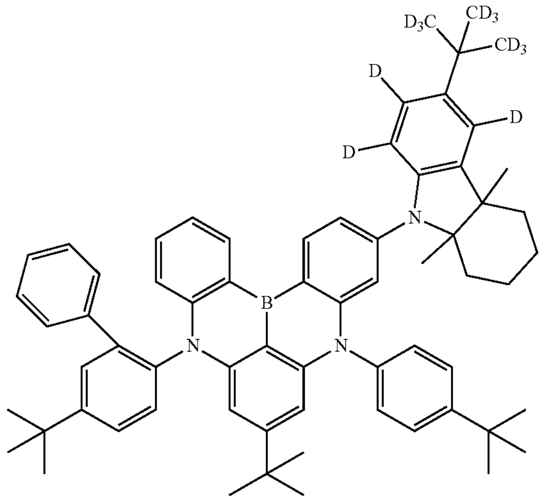
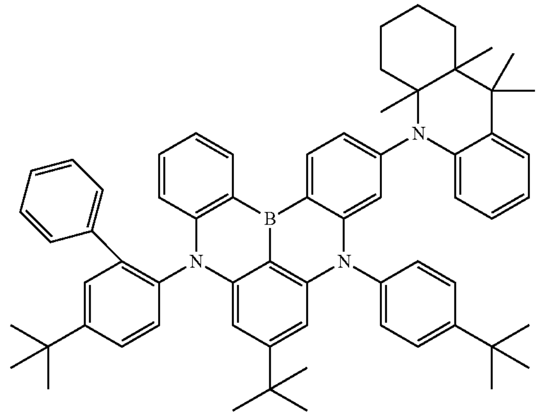
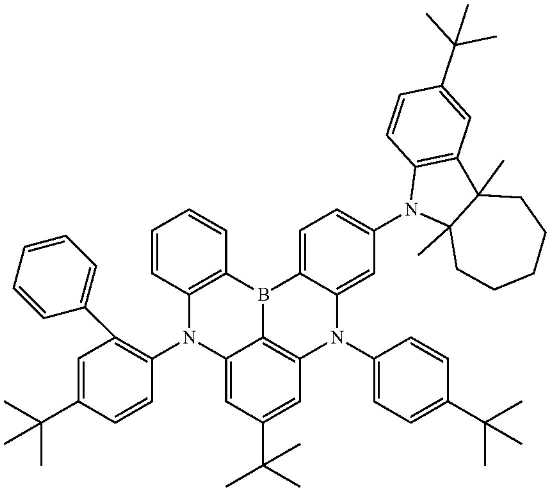

-continued
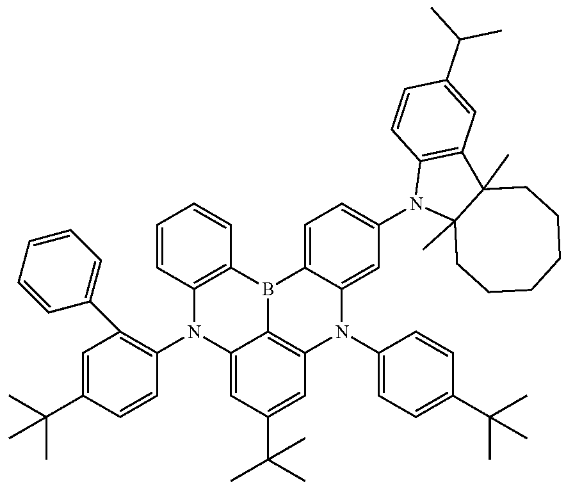
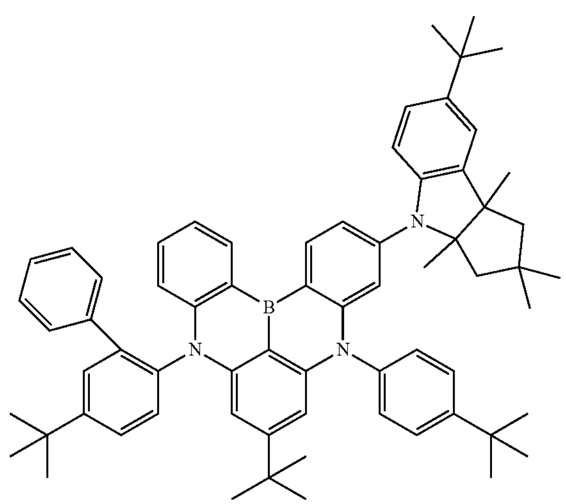
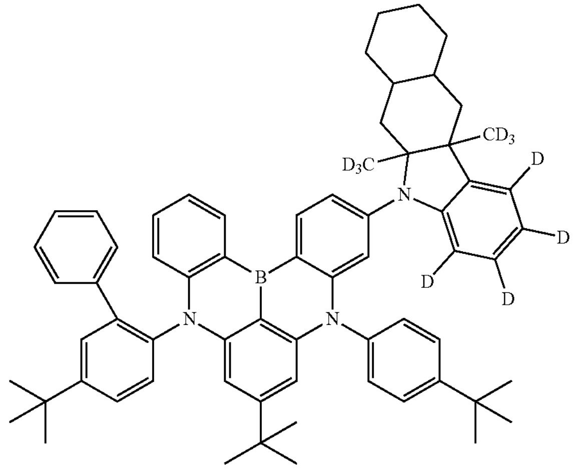
-continued
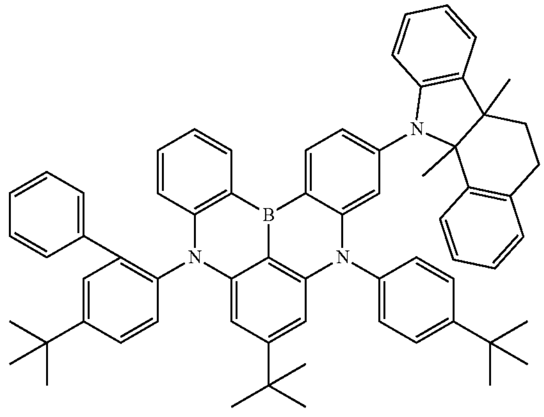
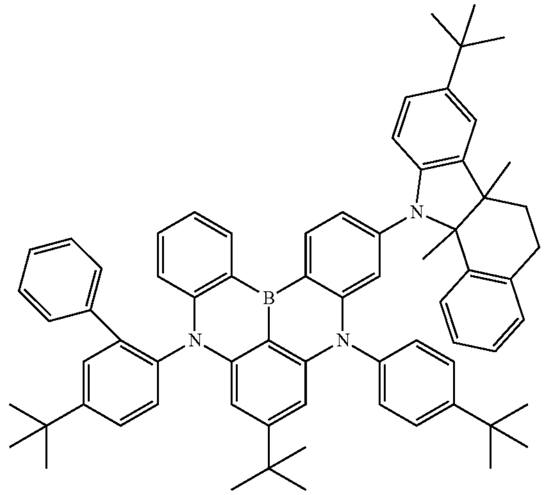
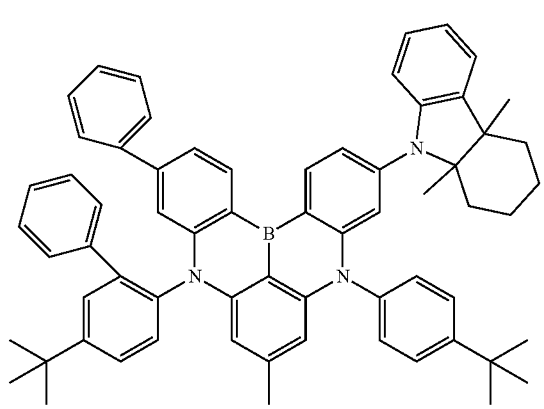

-continued
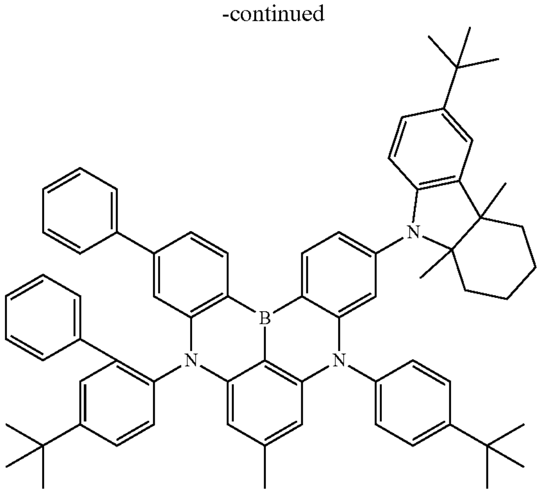
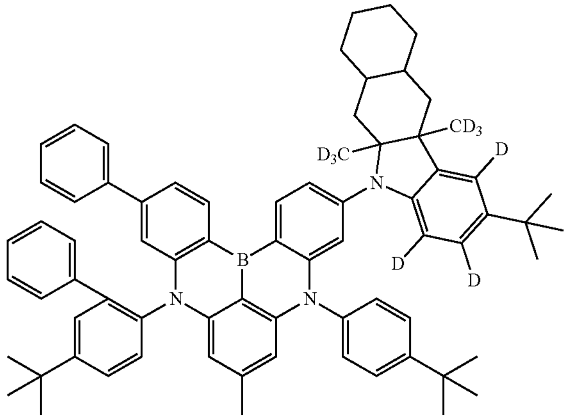
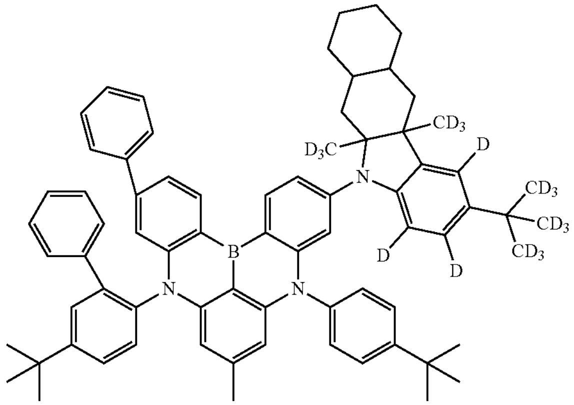
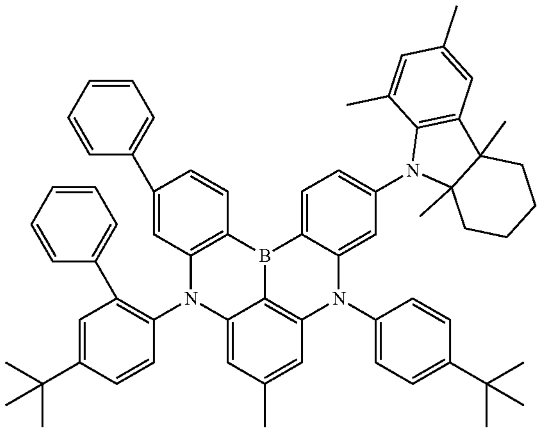
-continued
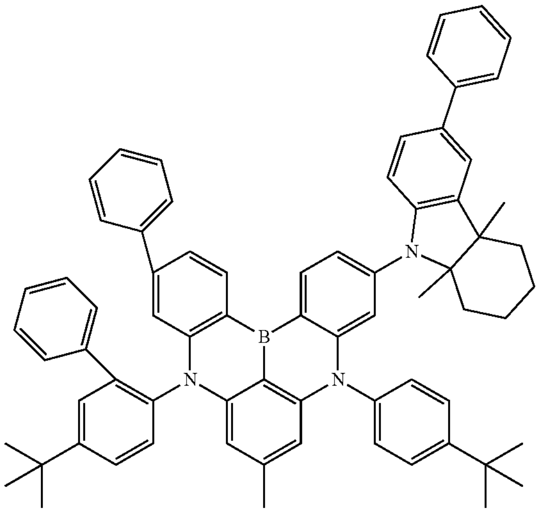
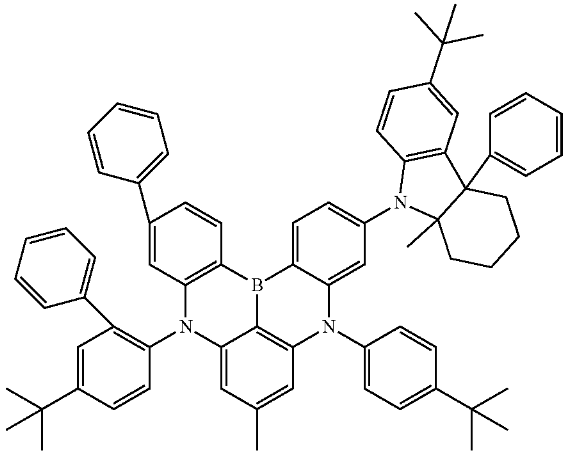
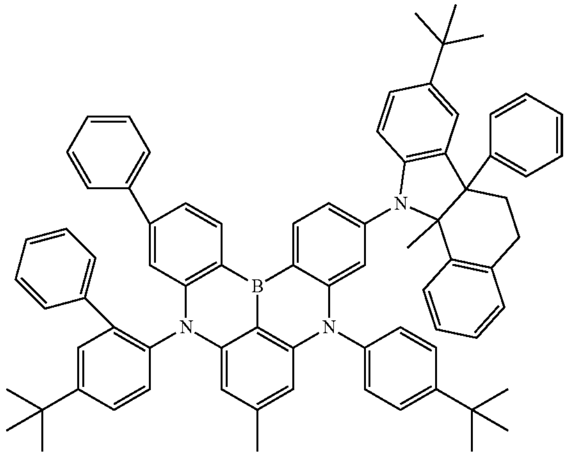

-continued
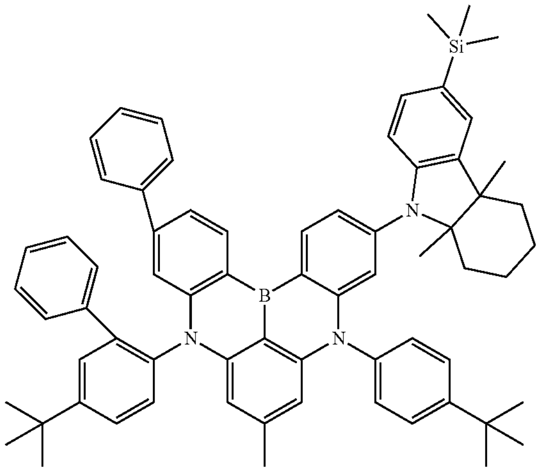
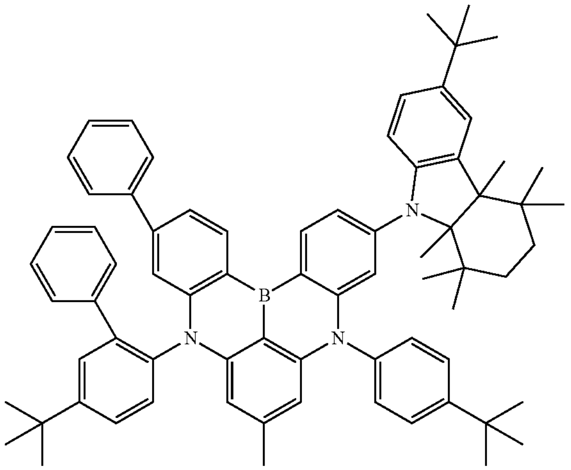
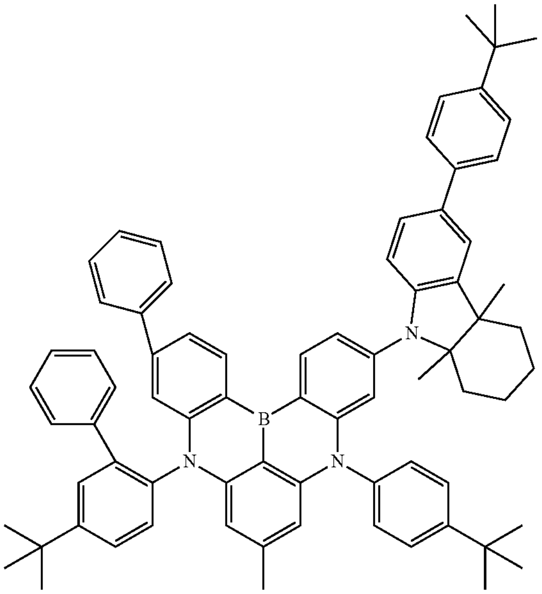
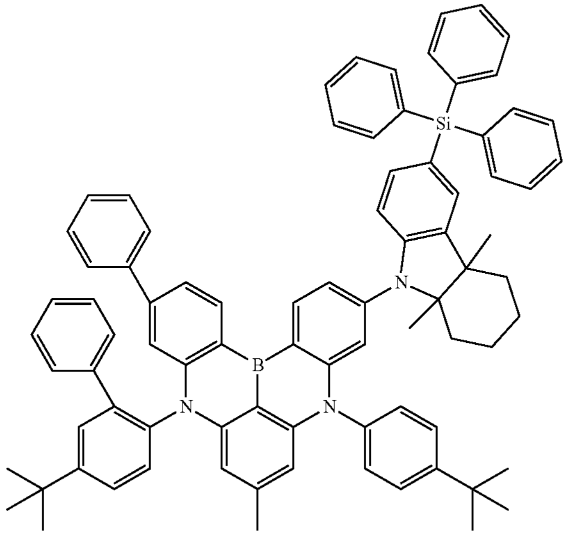
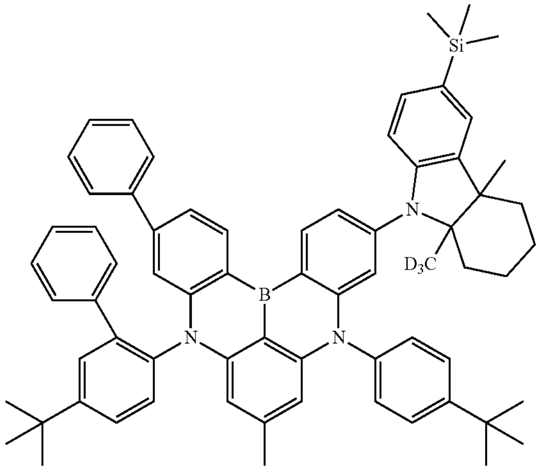
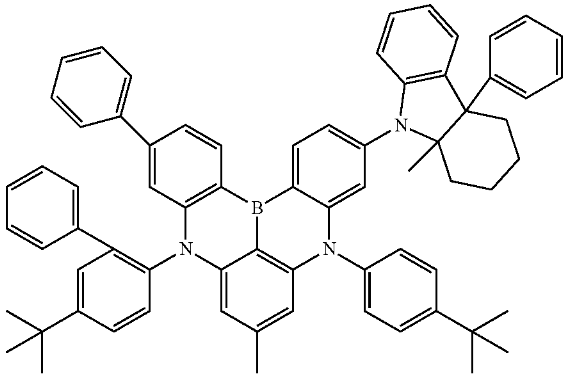
-continued -continued
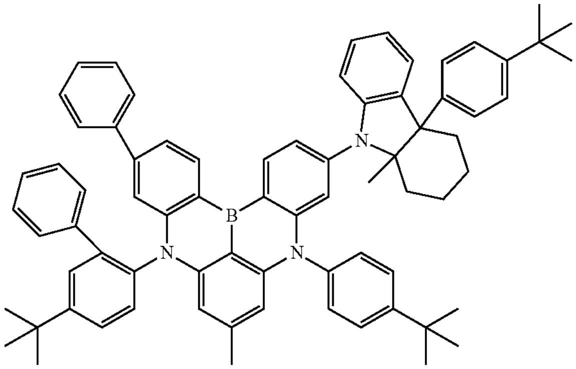
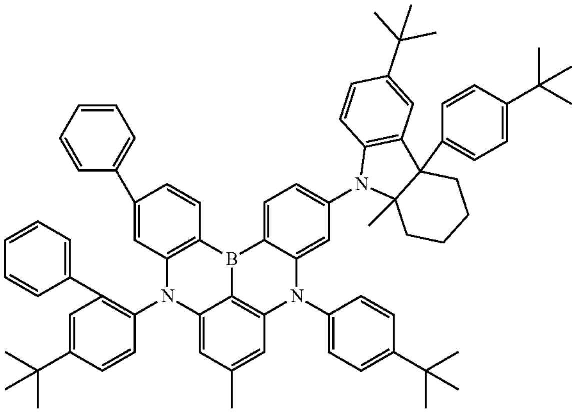
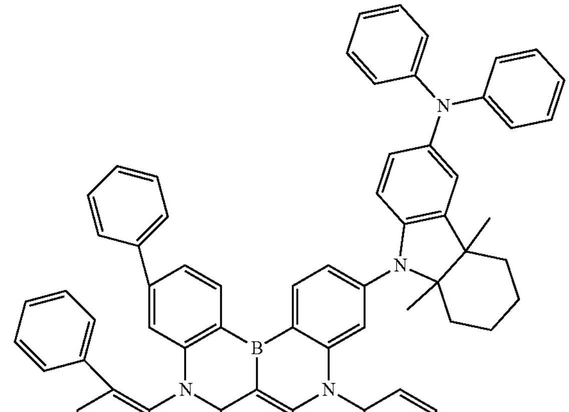
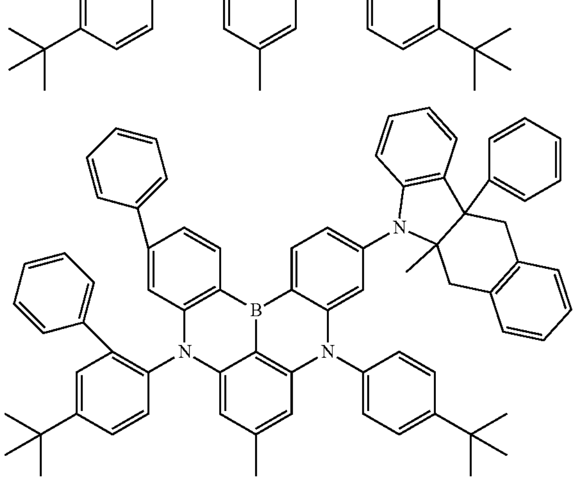
-continued
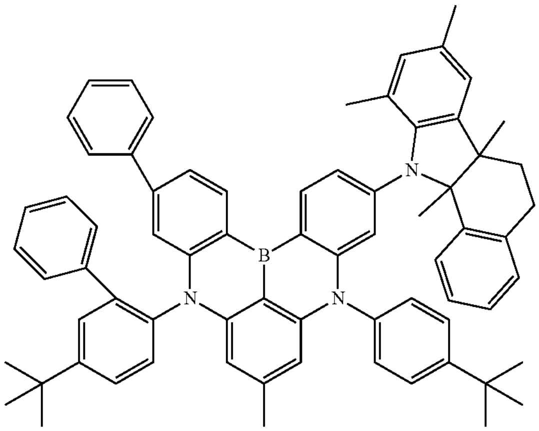
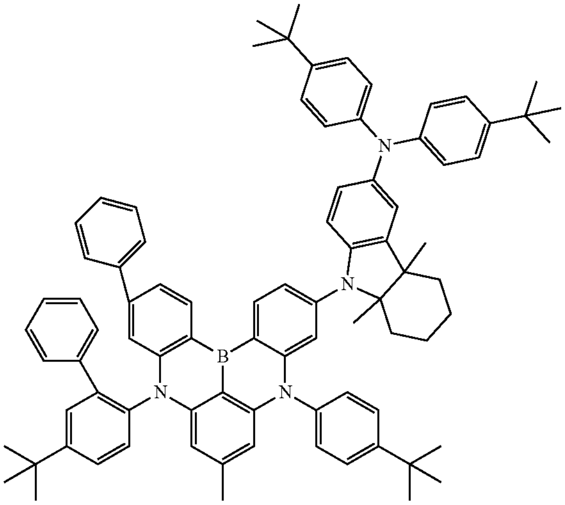
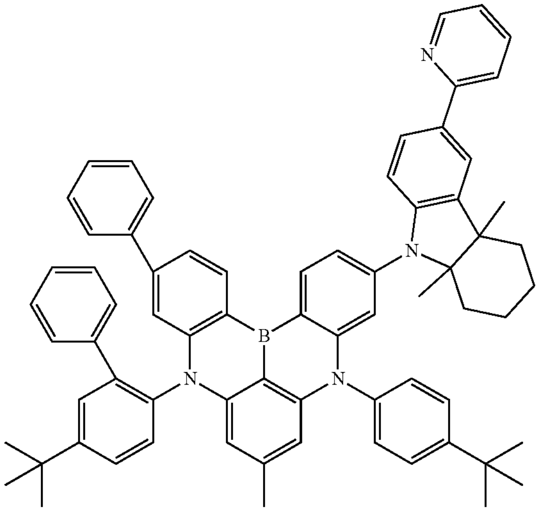

-continued
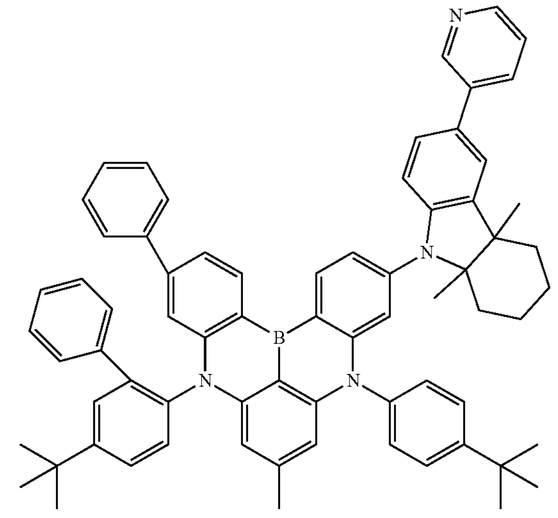
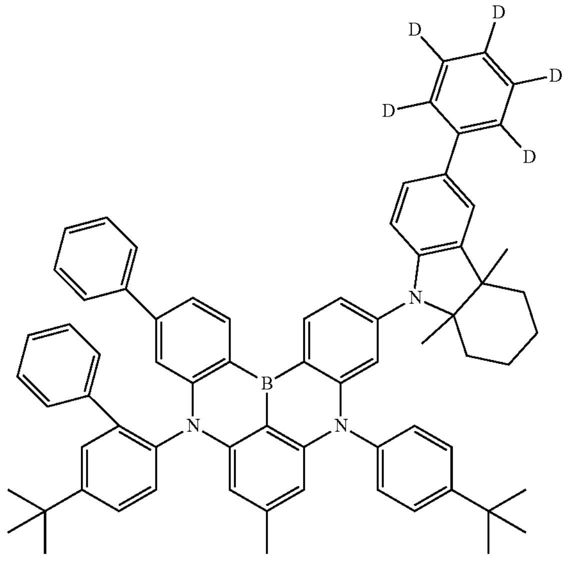
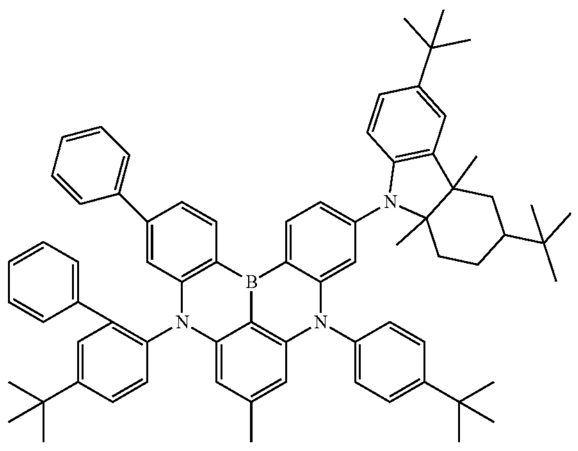
-continued
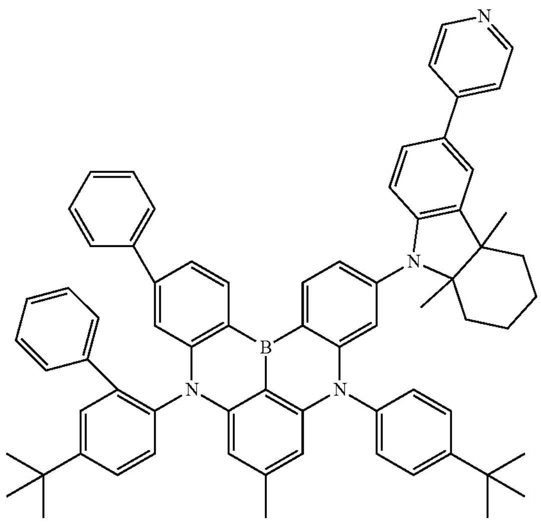
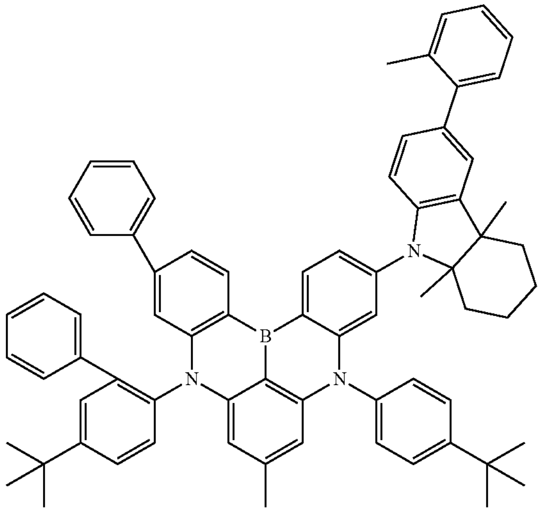
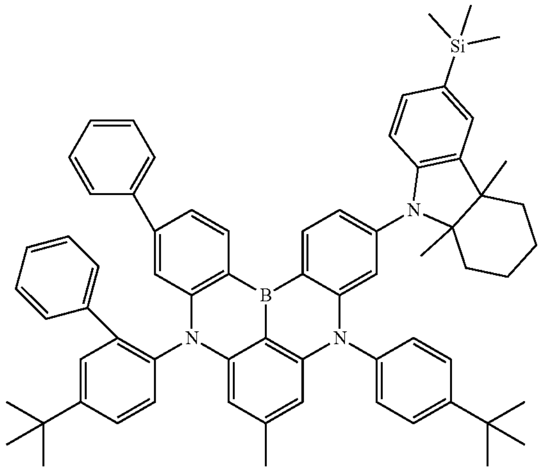

-continued
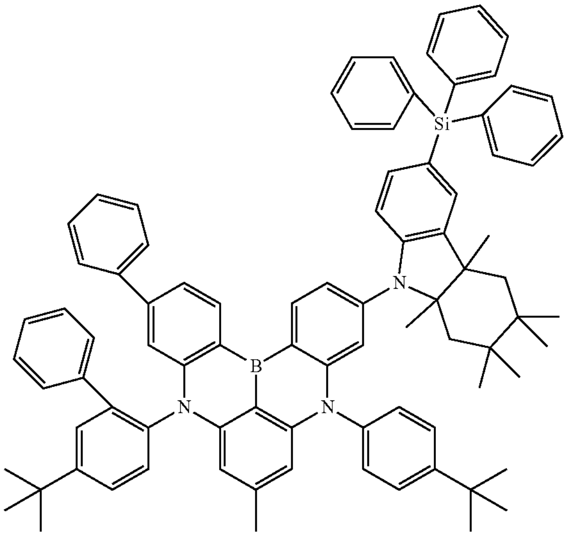
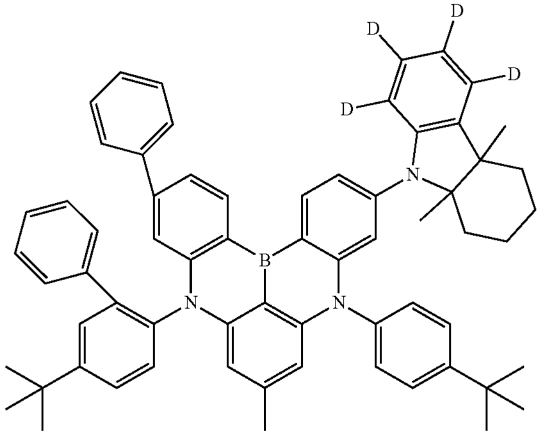
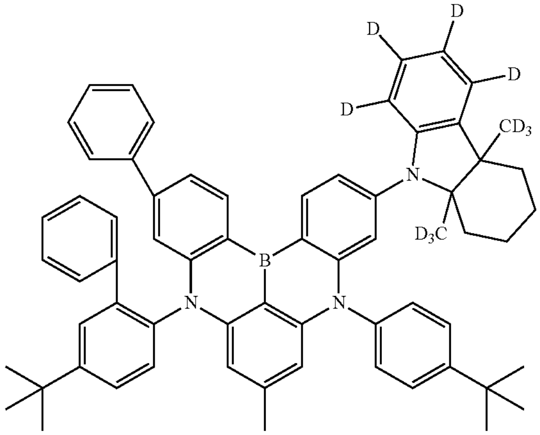
-continued
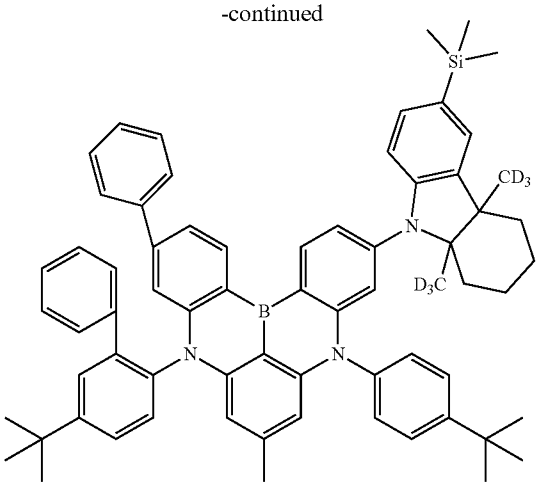
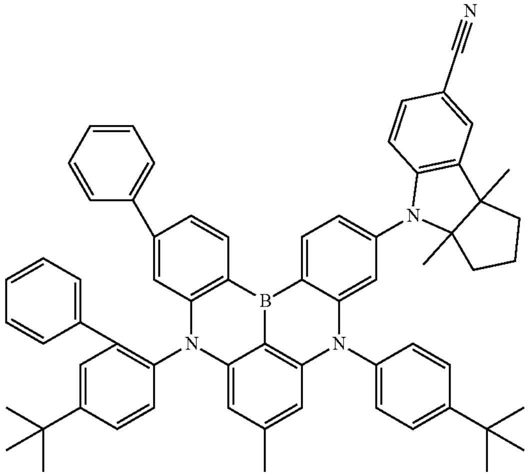
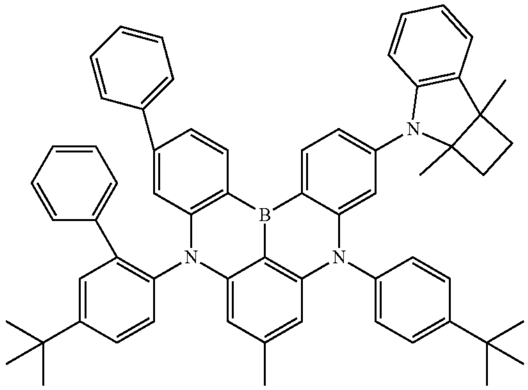
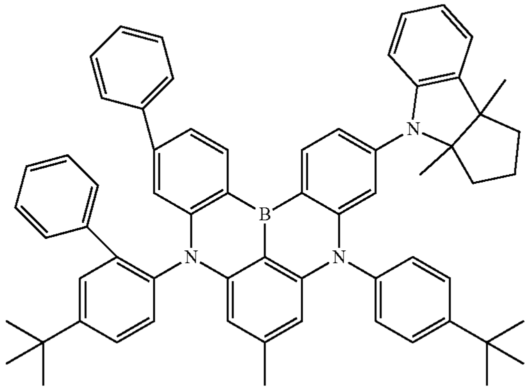

-continued
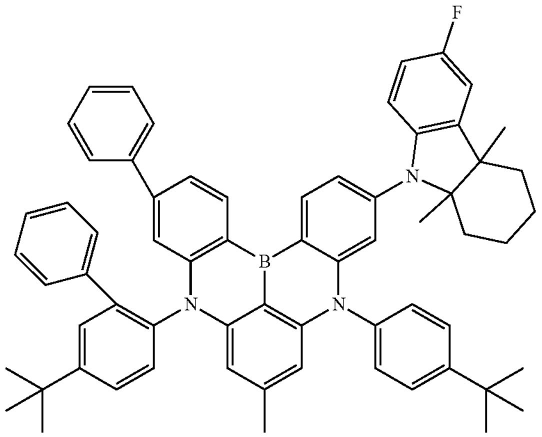
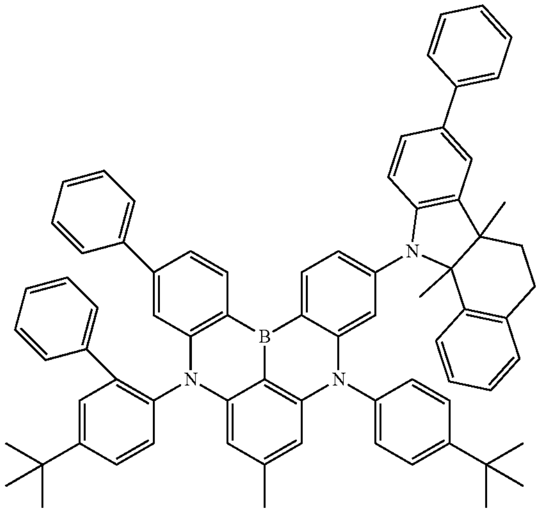
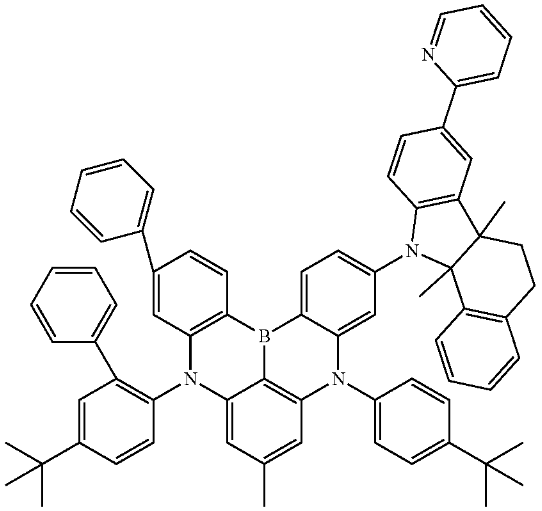
-continued
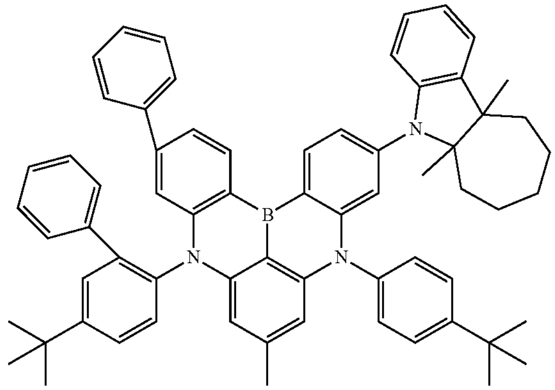
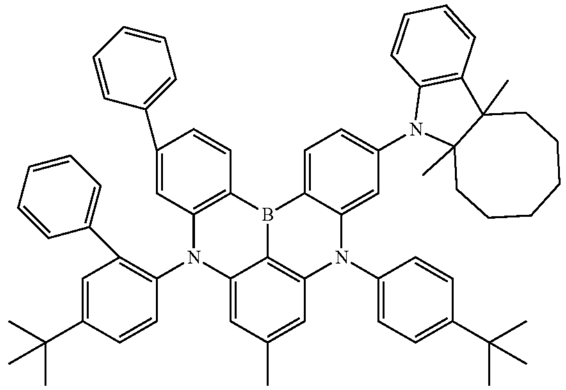
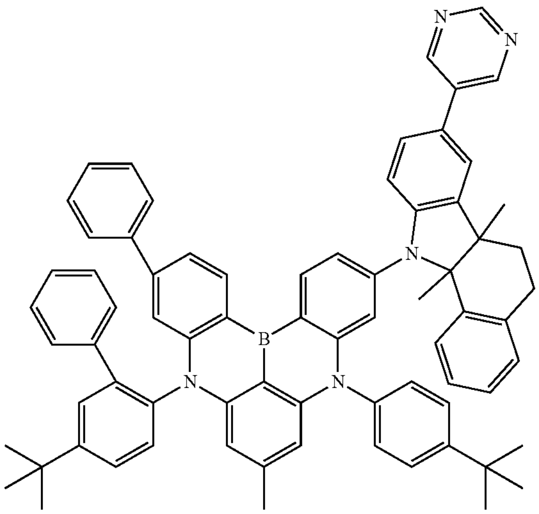

-continued
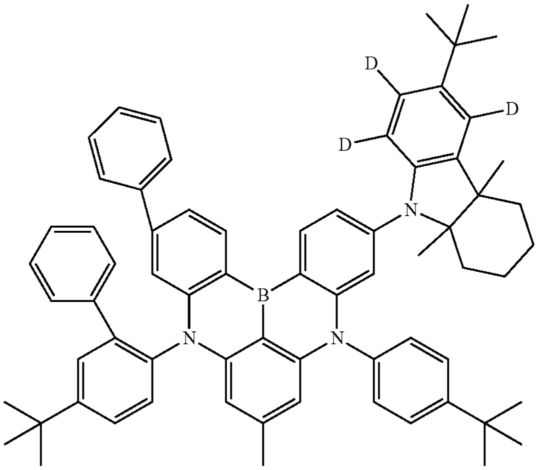
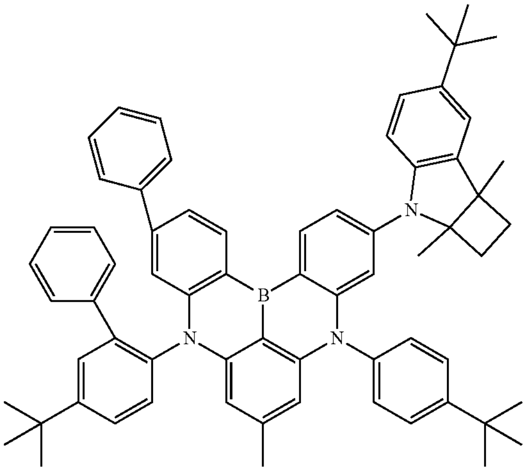
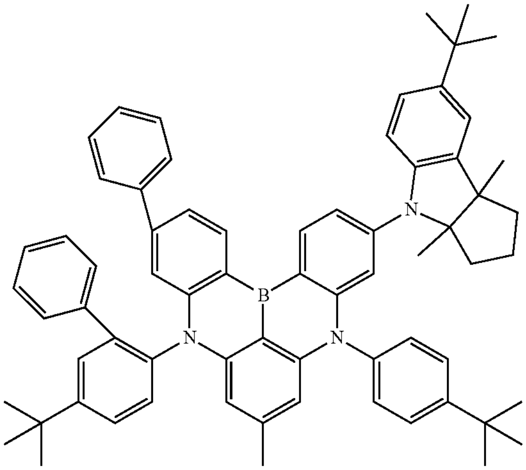
-continued
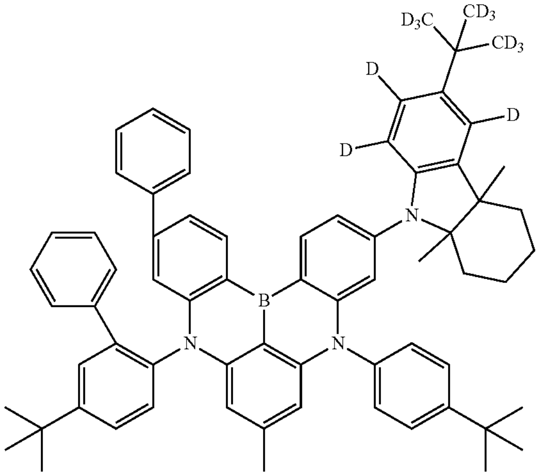
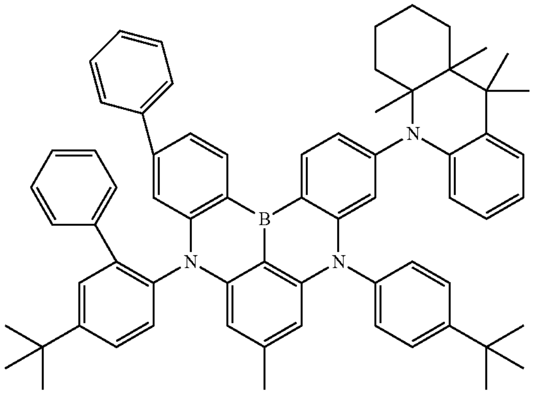
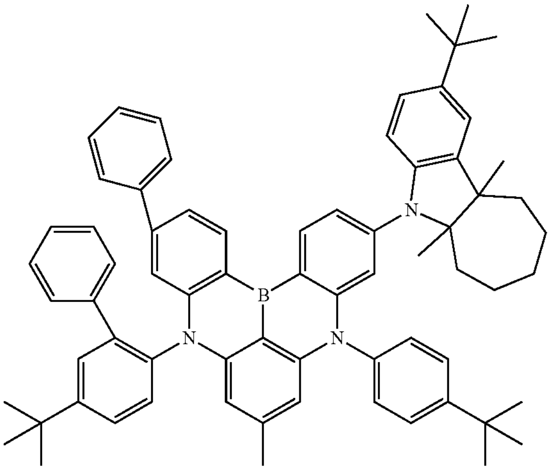

-continued
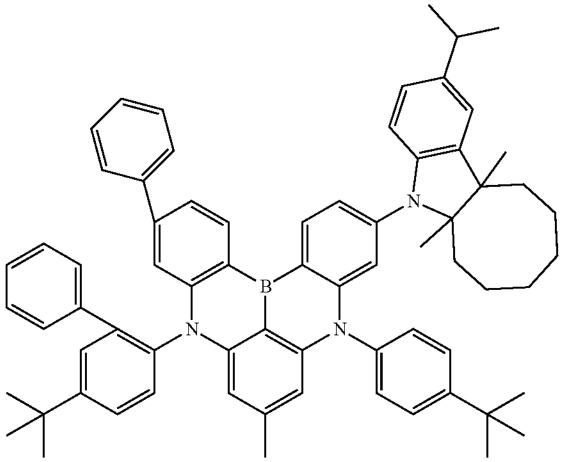
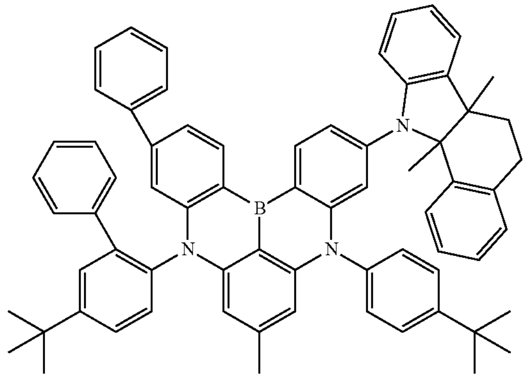
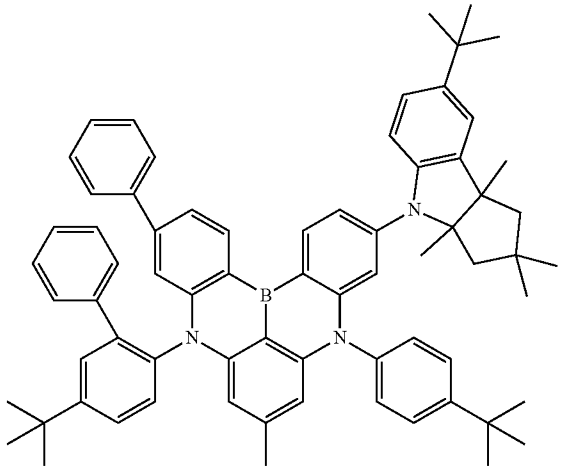
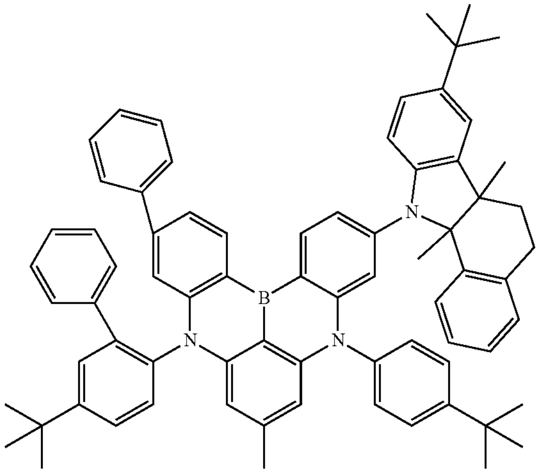
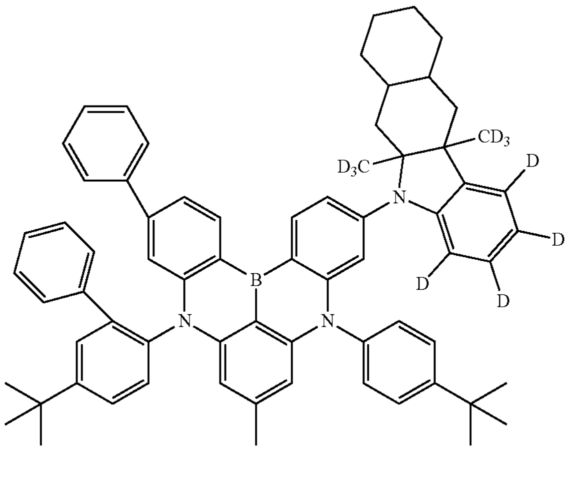
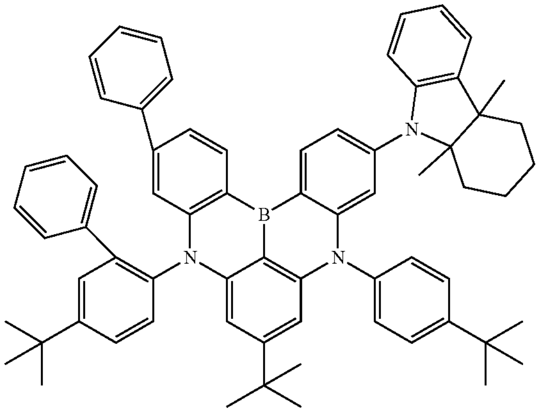
-continued -continued
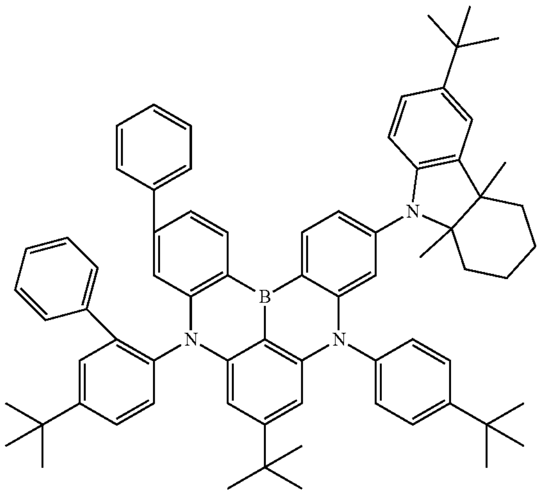
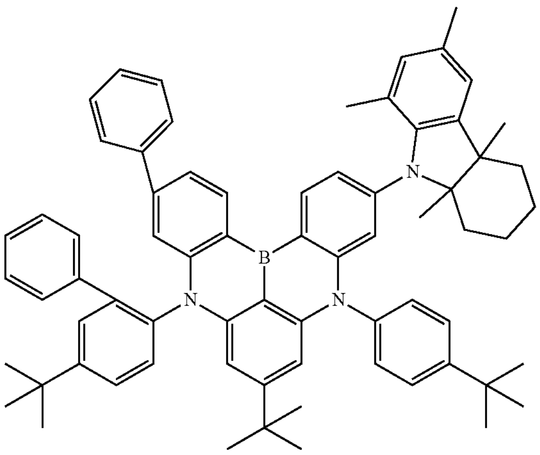
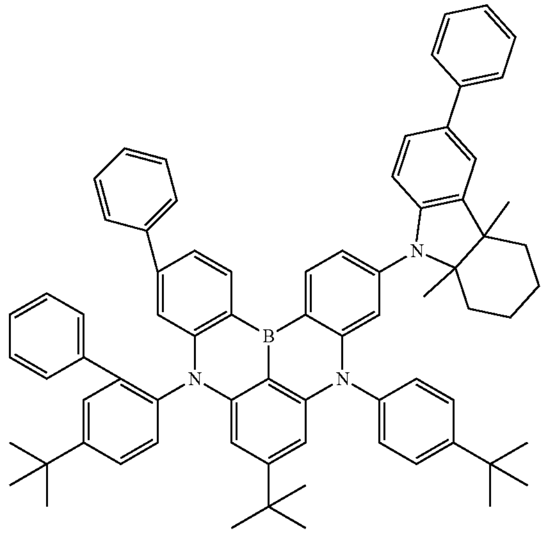
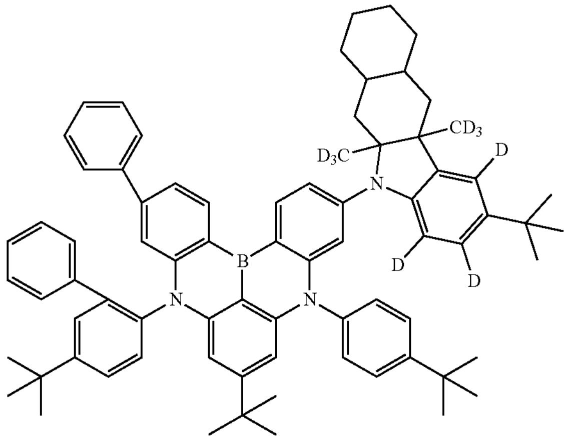
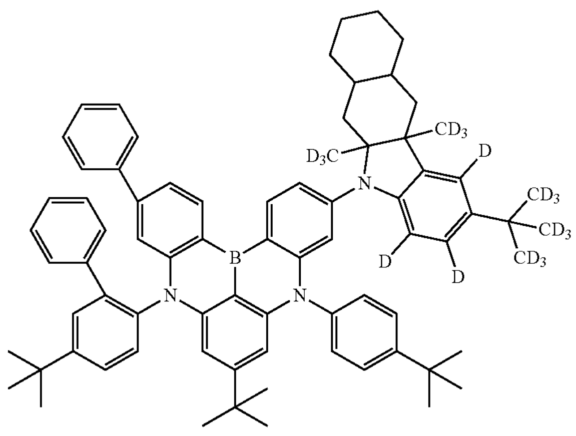
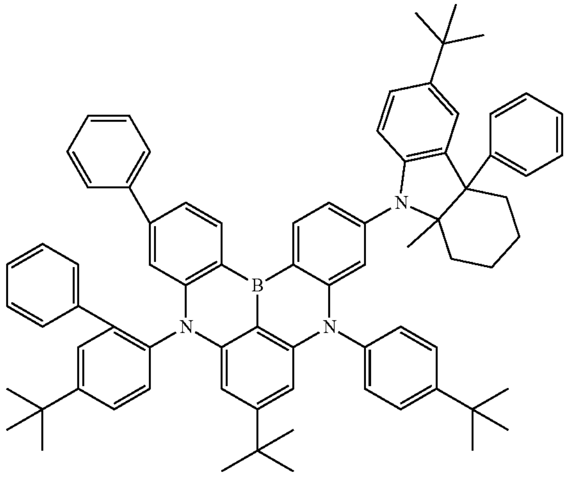

-continued
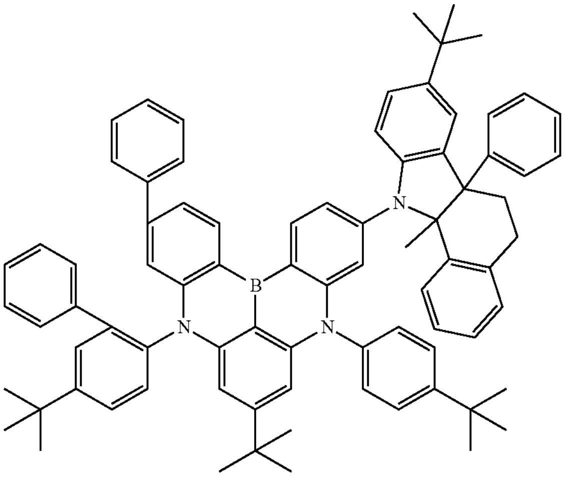
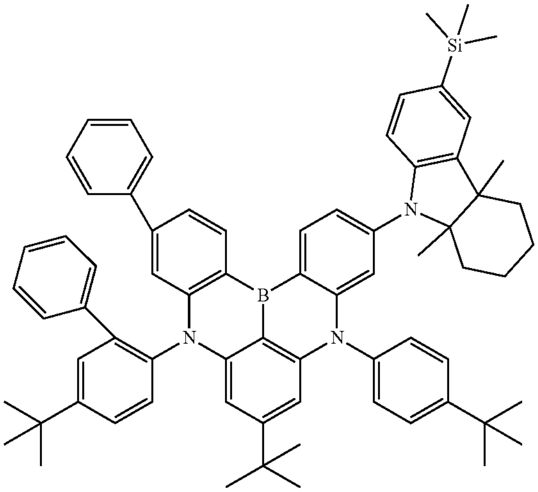
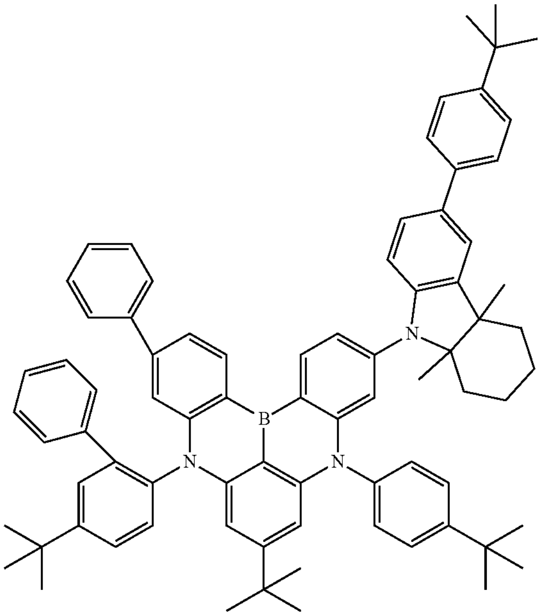
-continued
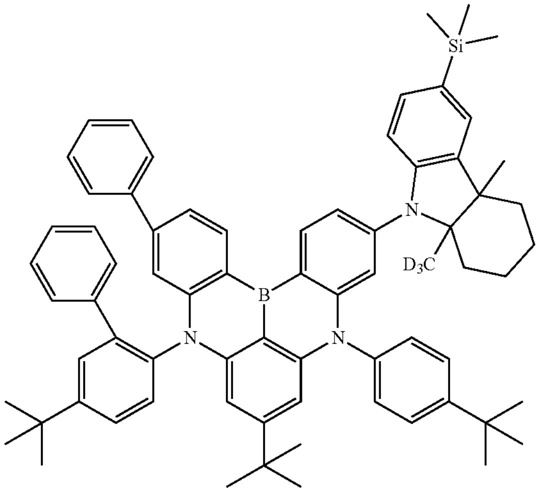
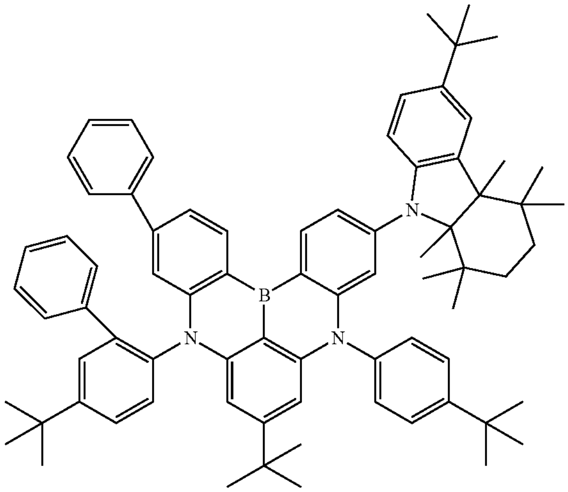
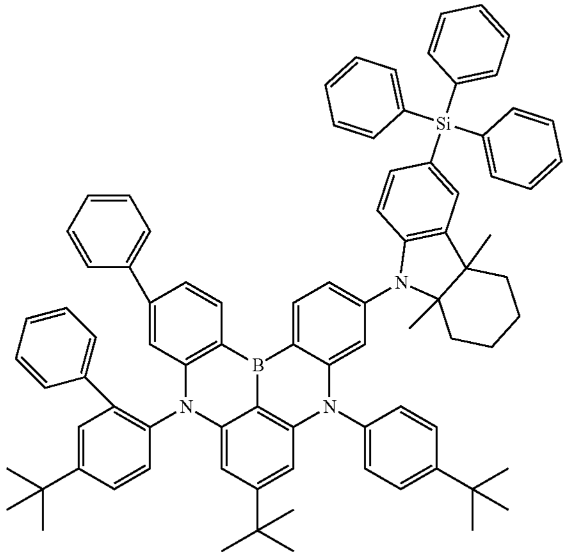

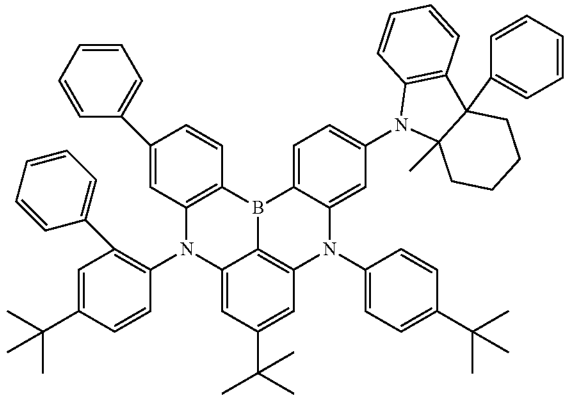
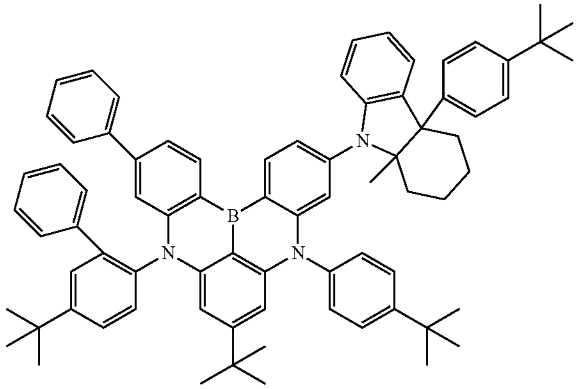
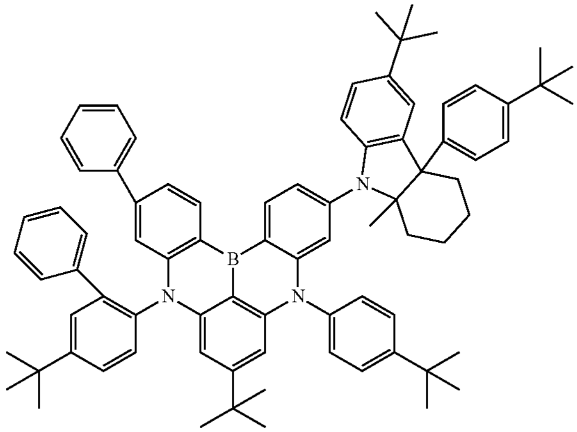
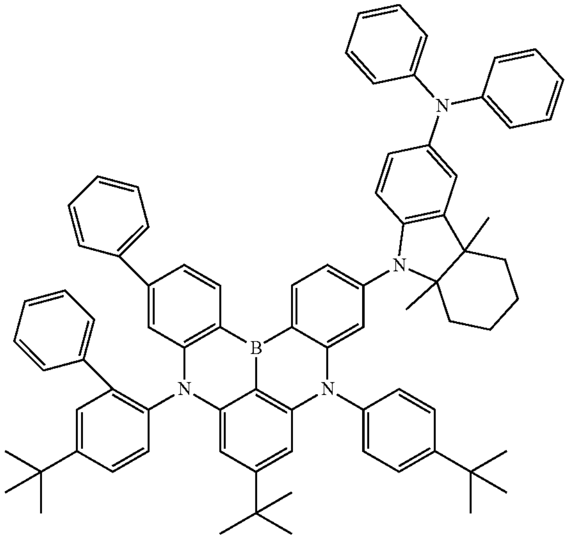
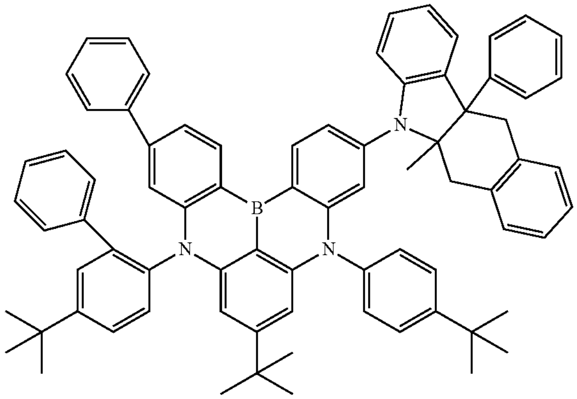
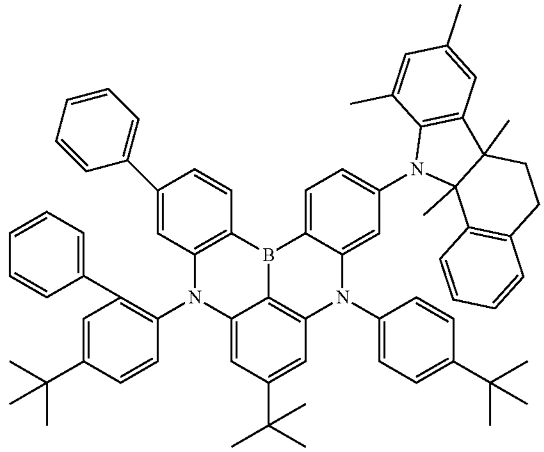

3653
-continued
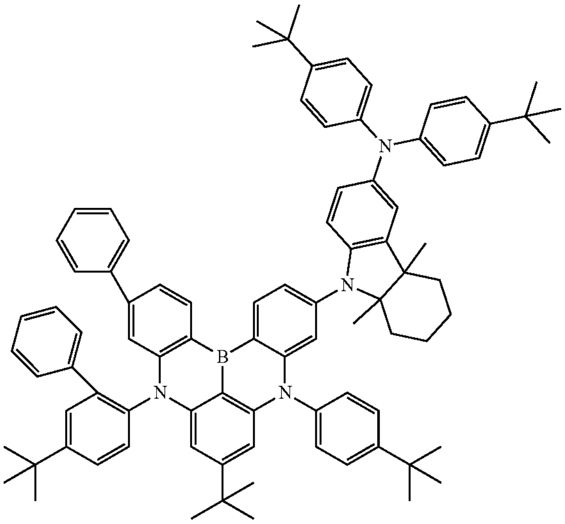
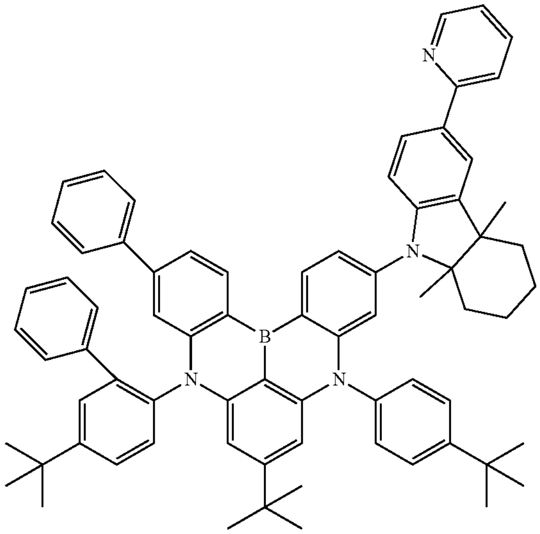
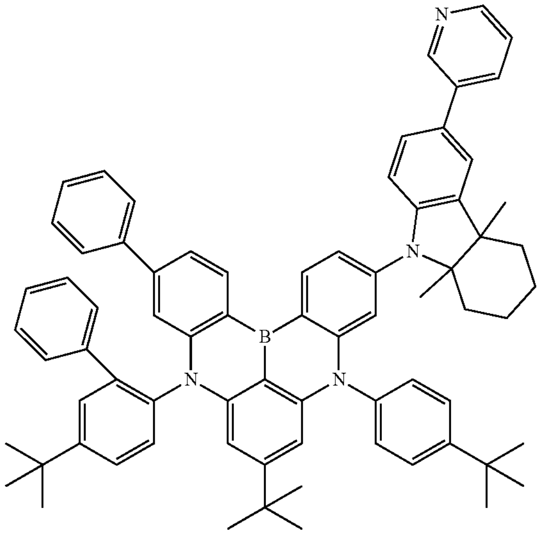
3654
-continued
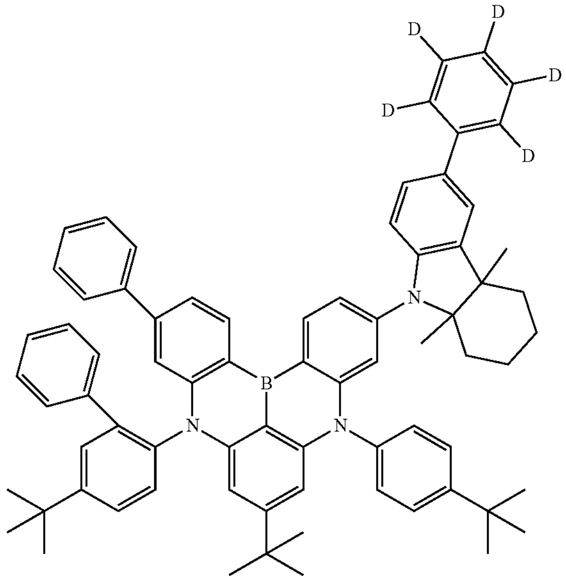
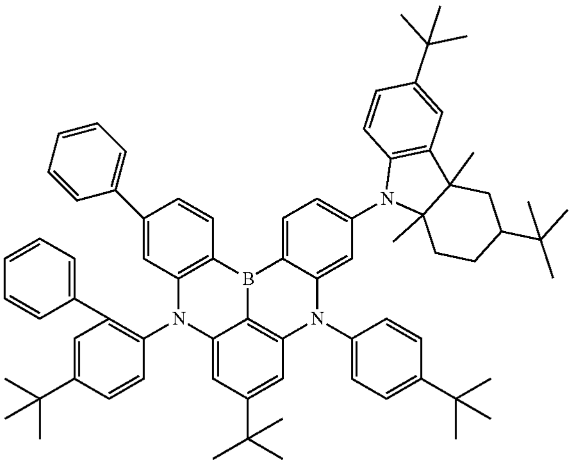
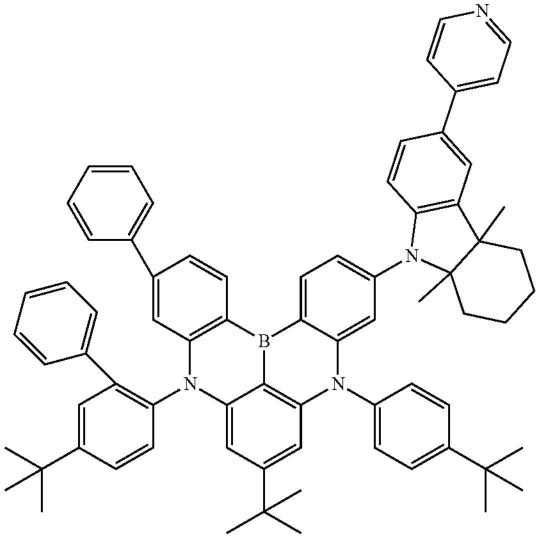

-continued
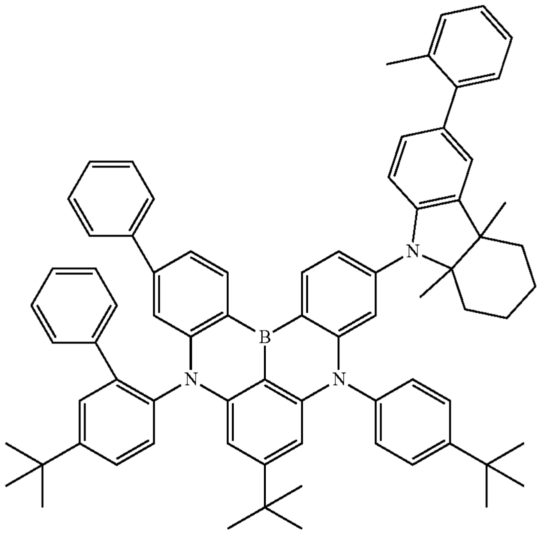
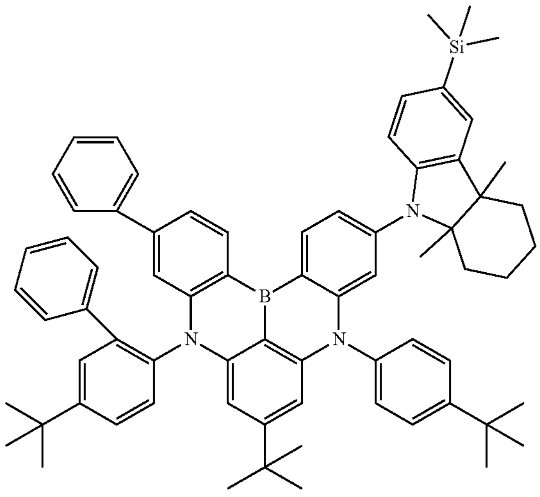
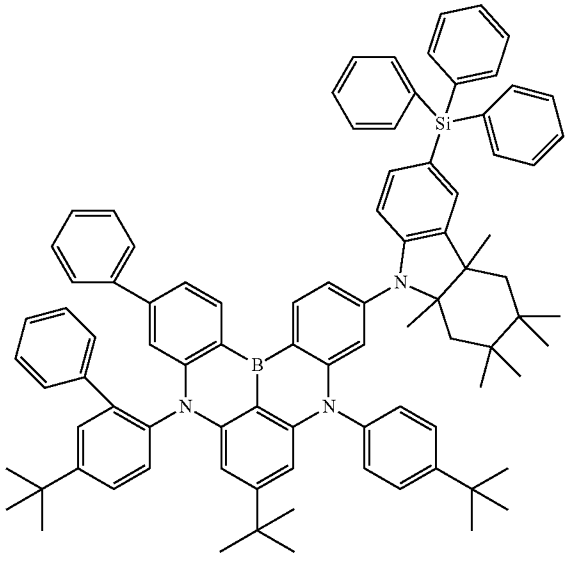
-continued
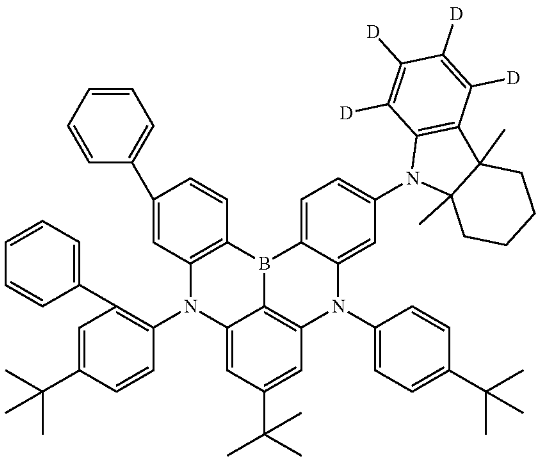
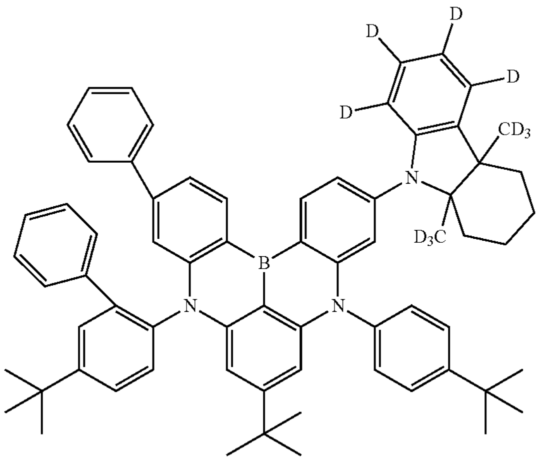
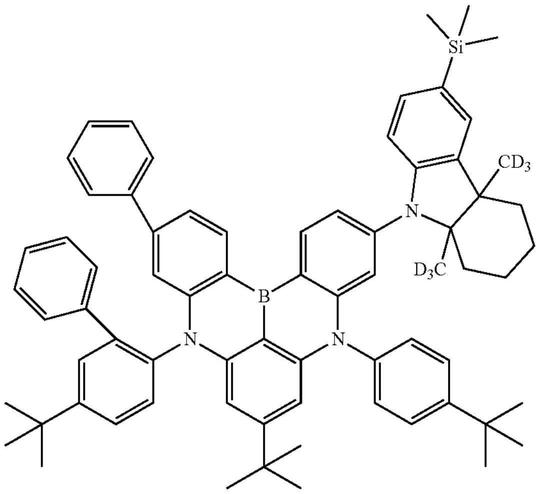

-continued
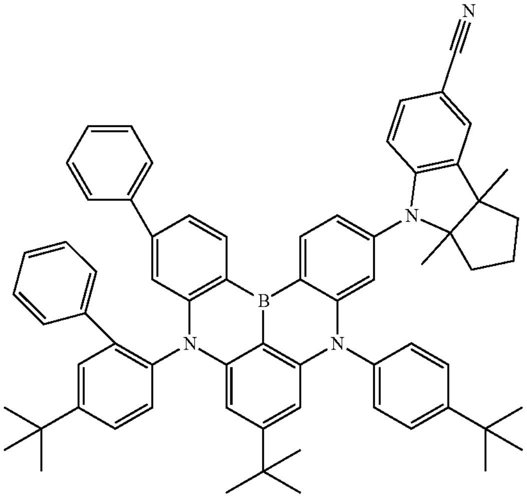
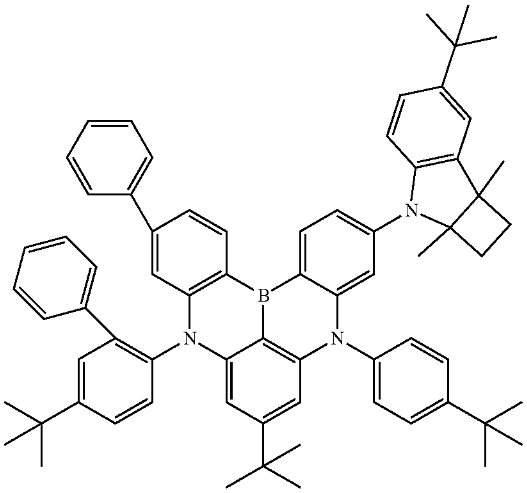
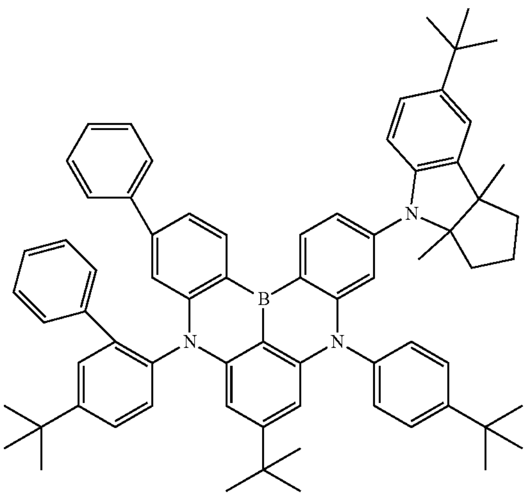
-continued
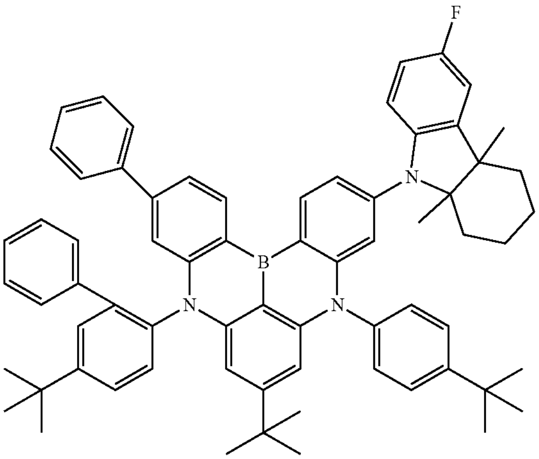
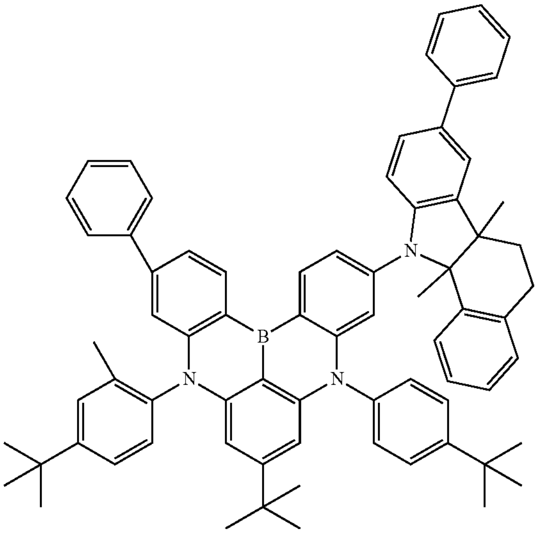
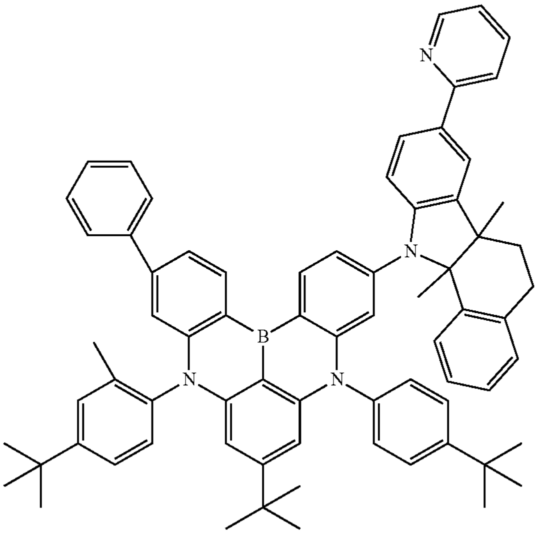

-continued
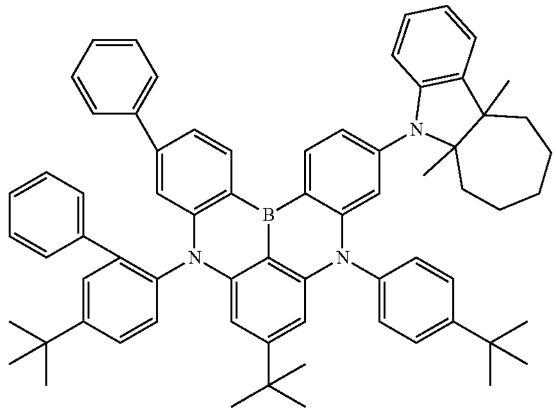
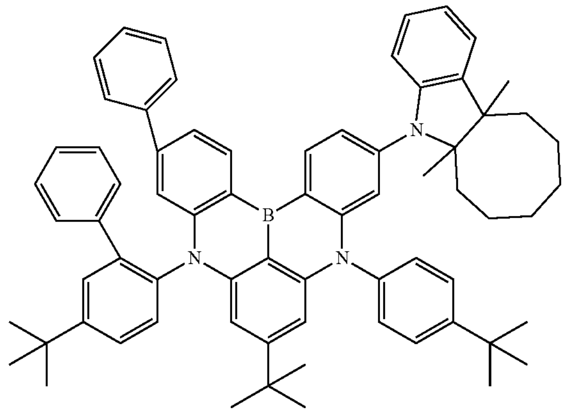
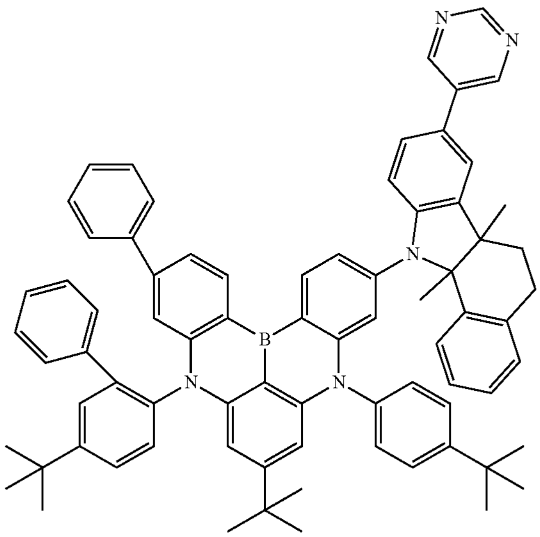
-continued
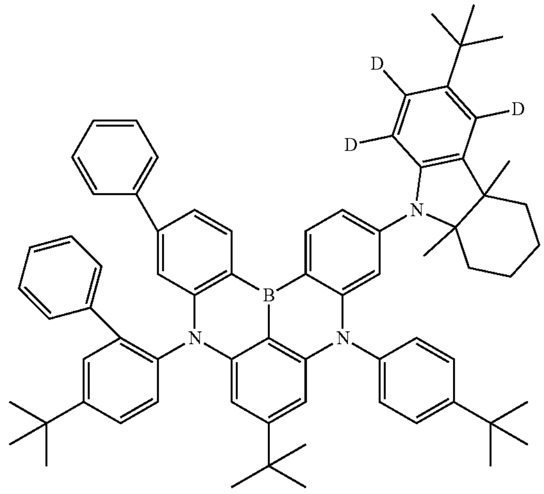
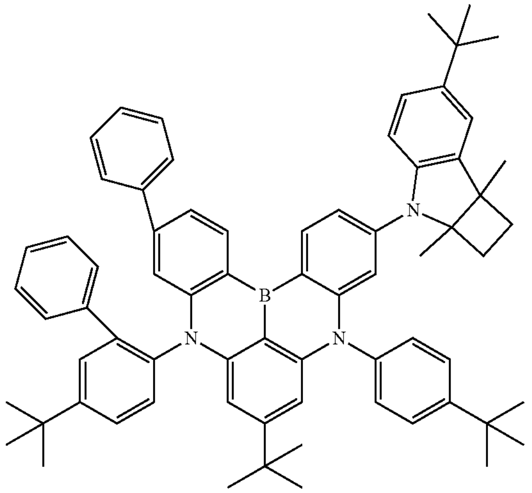
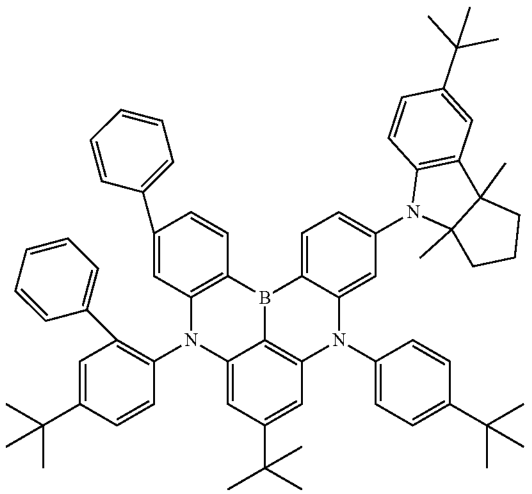

-continued
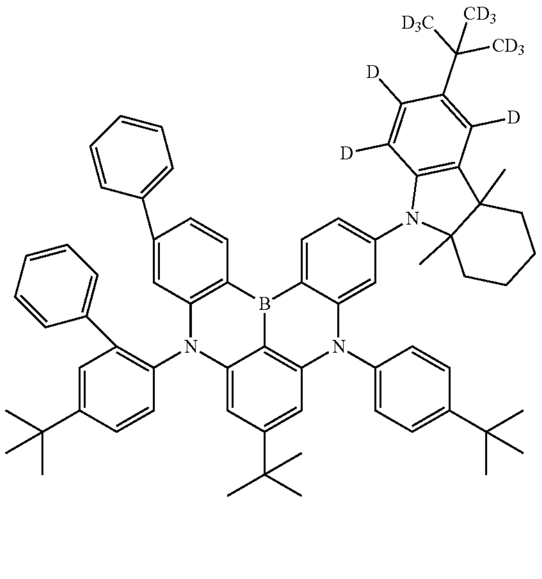
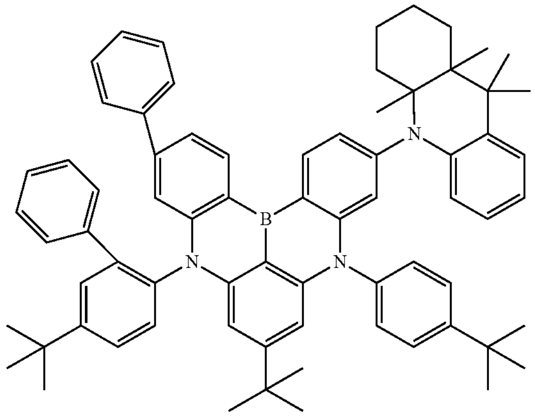
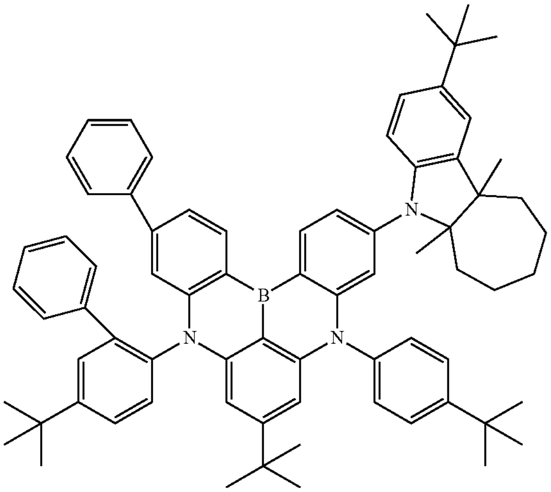
-continued
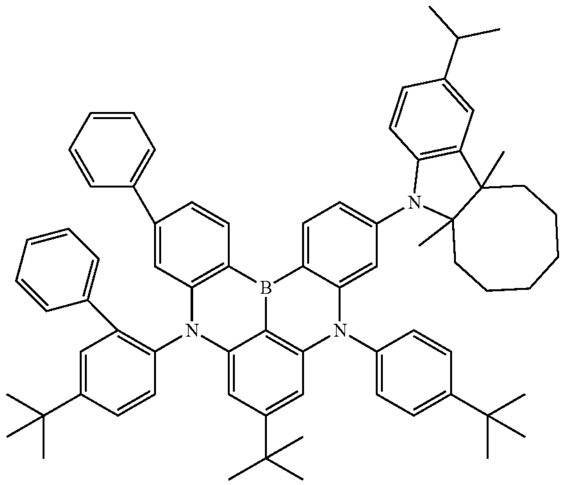
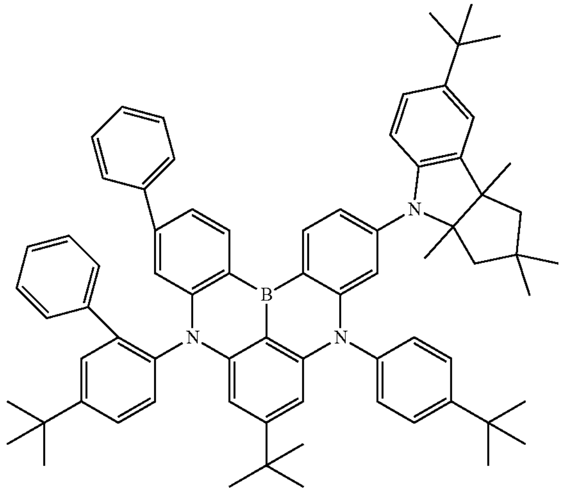
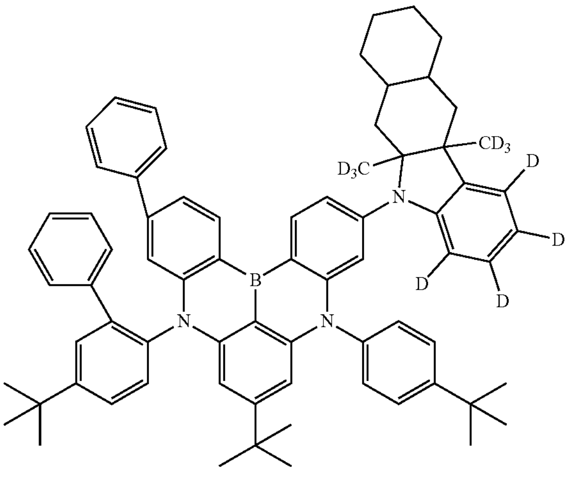

-continued
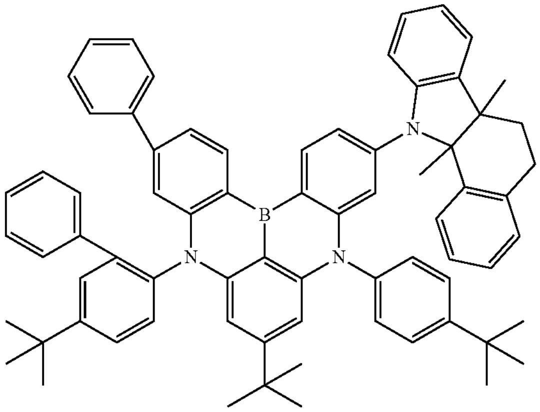
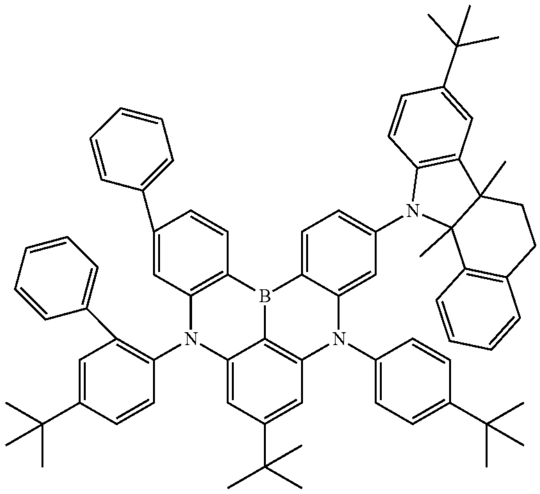
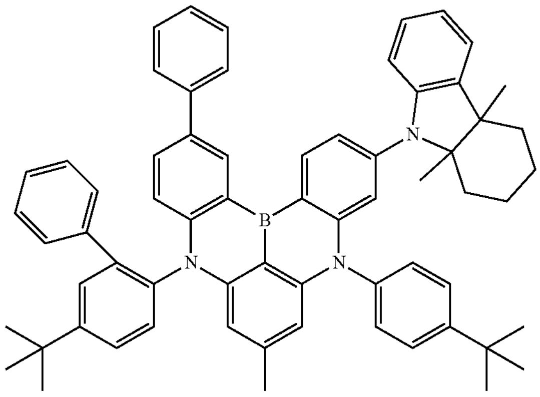
-continued
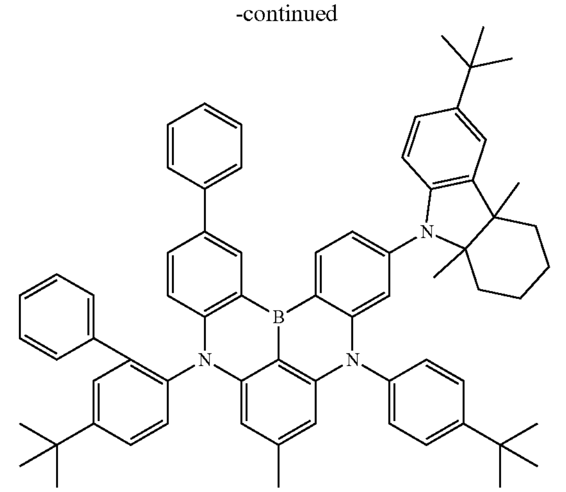
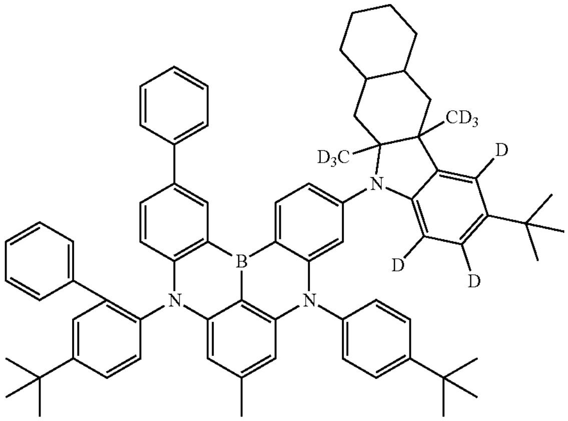
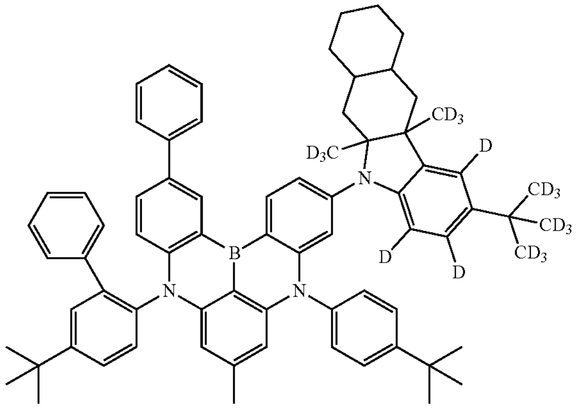
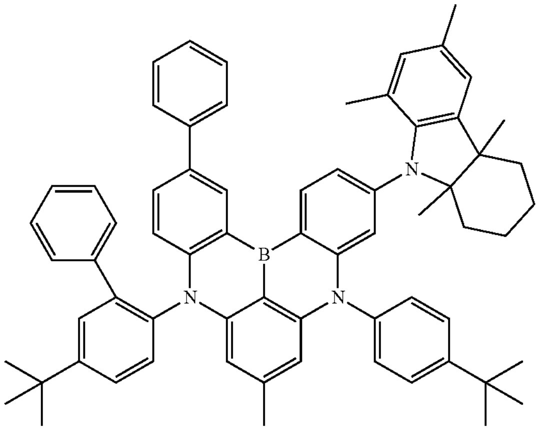

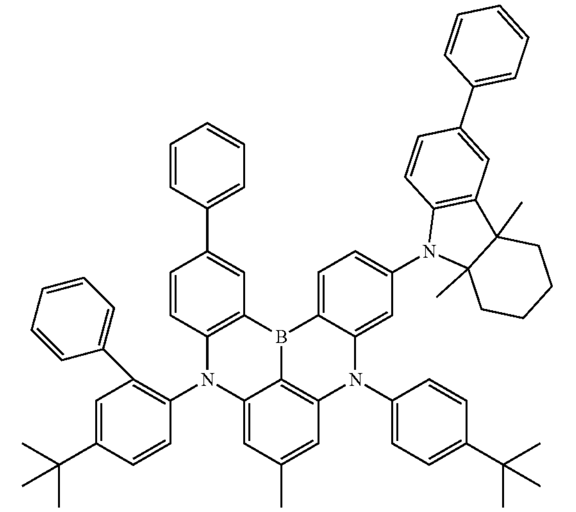
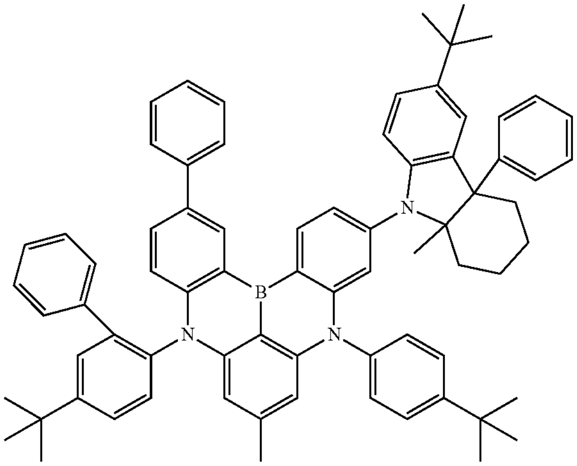
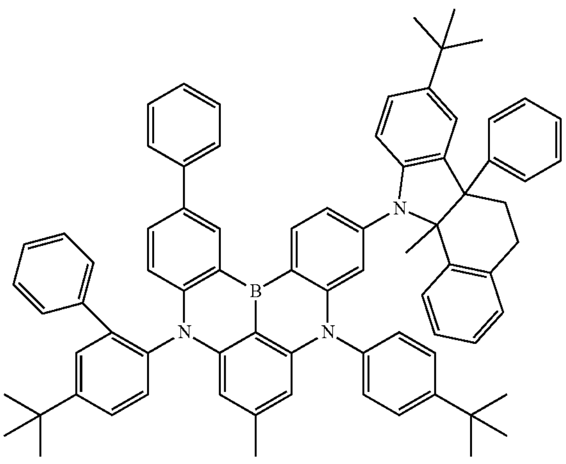
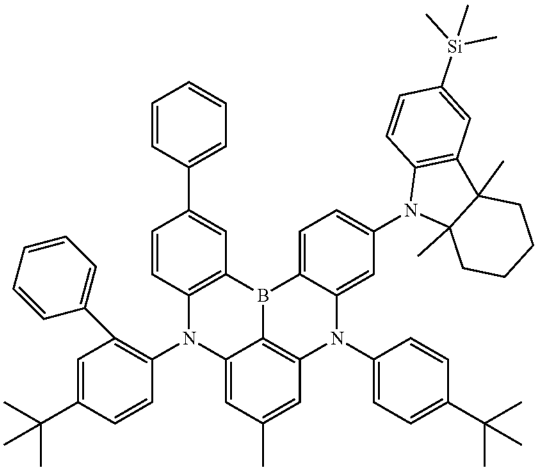
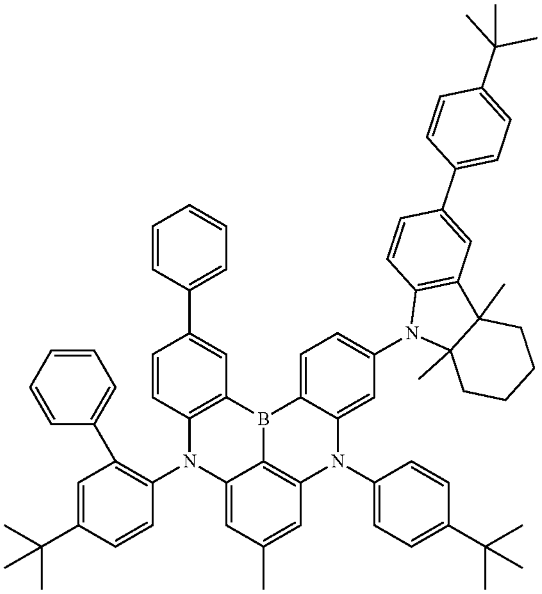
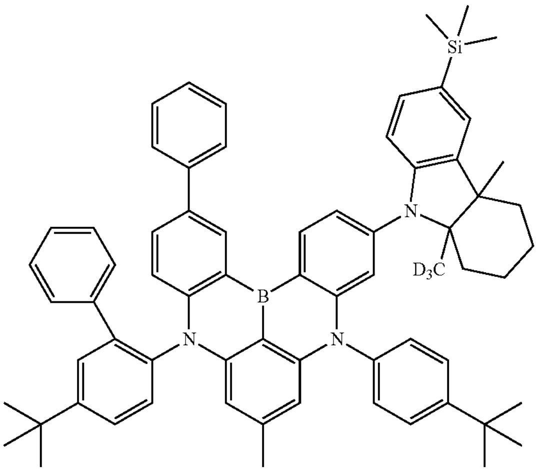

-continued
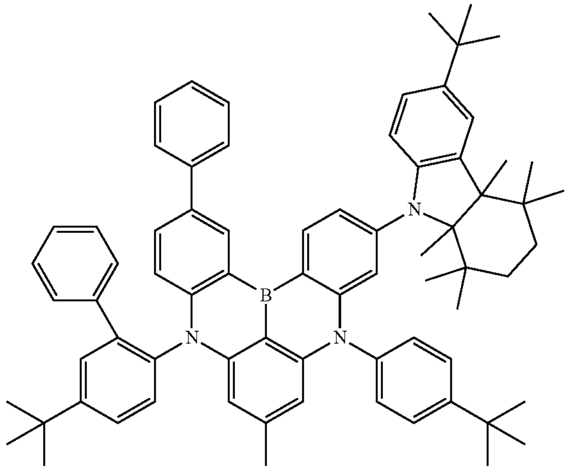
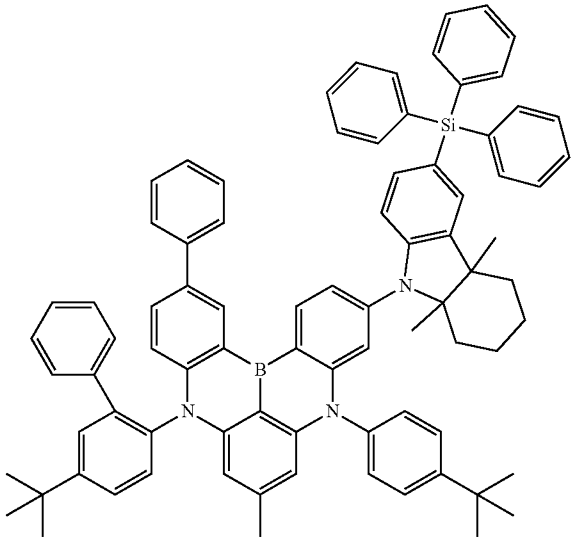
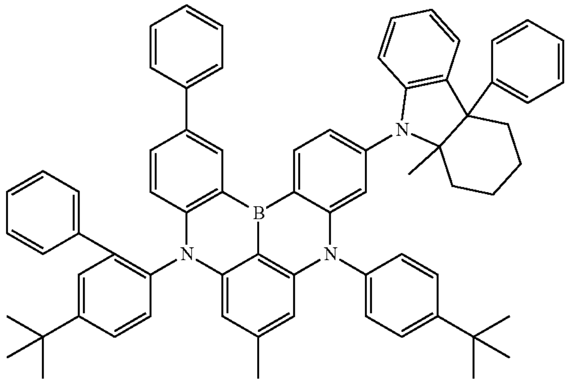
-continued
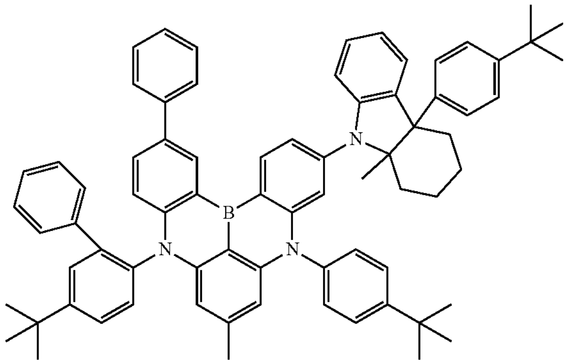
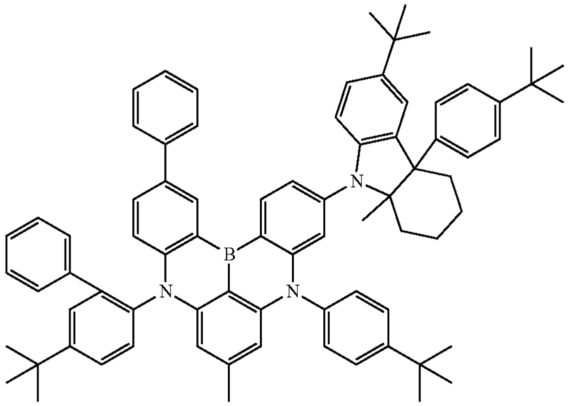
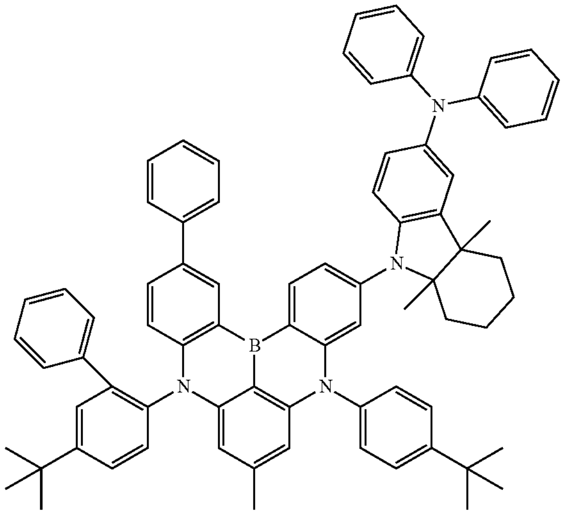

-continued
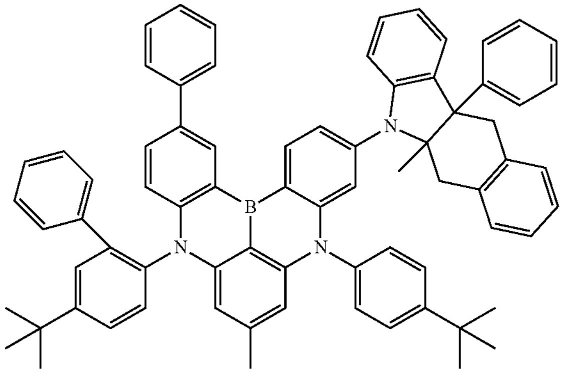
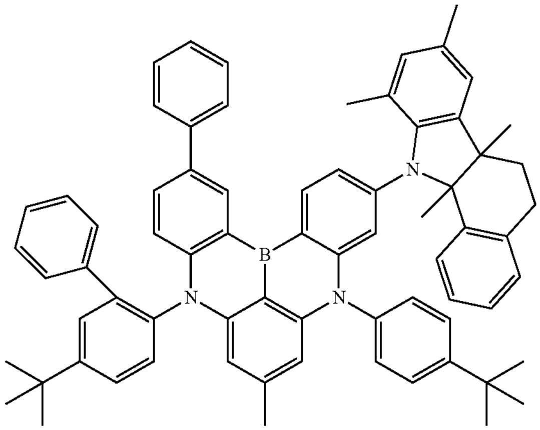
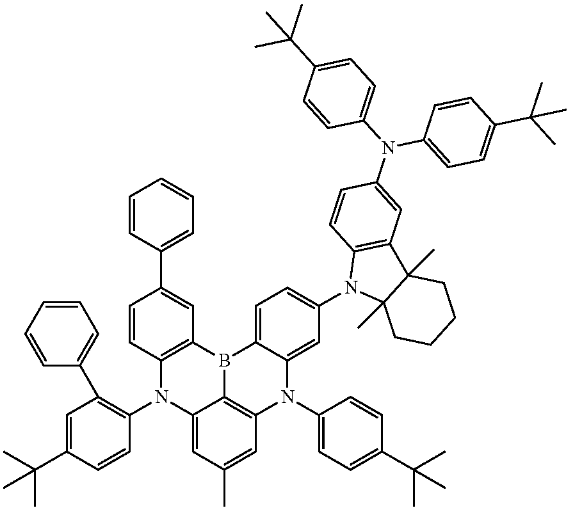
-continued
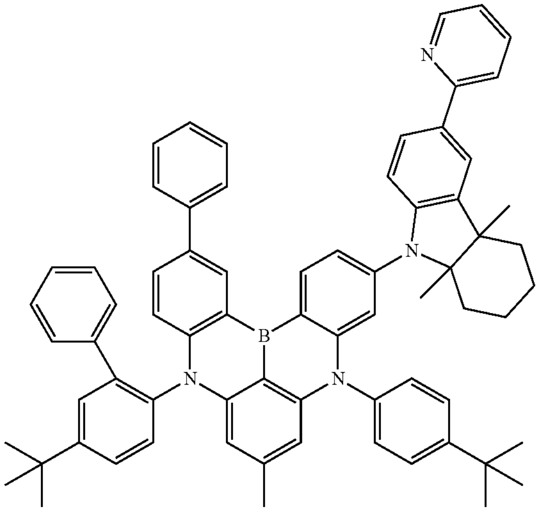
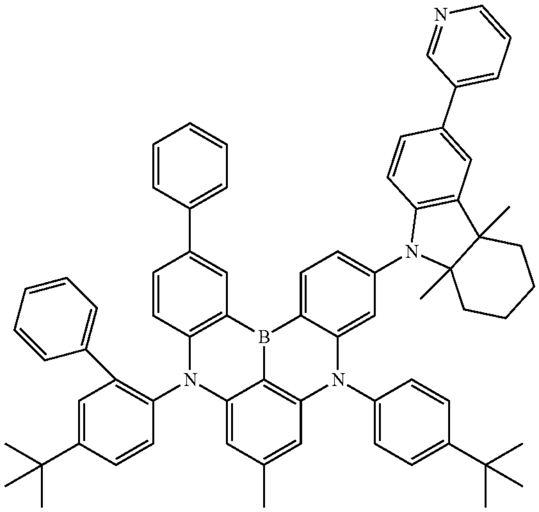
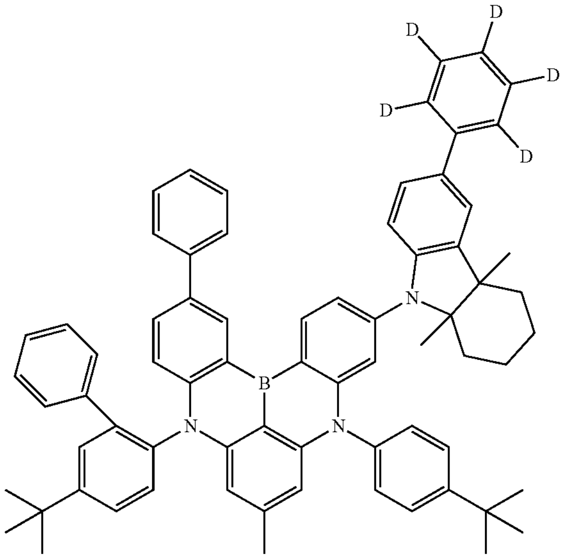

-continued
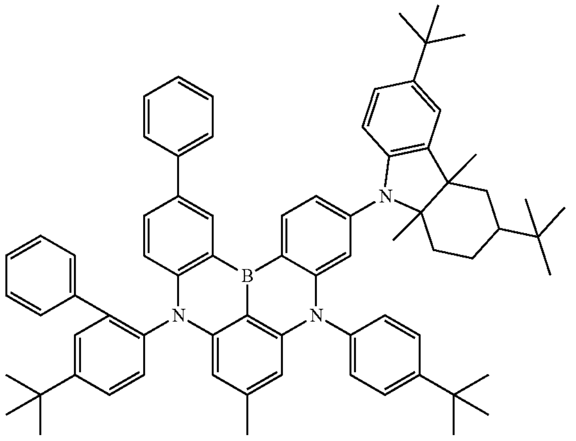
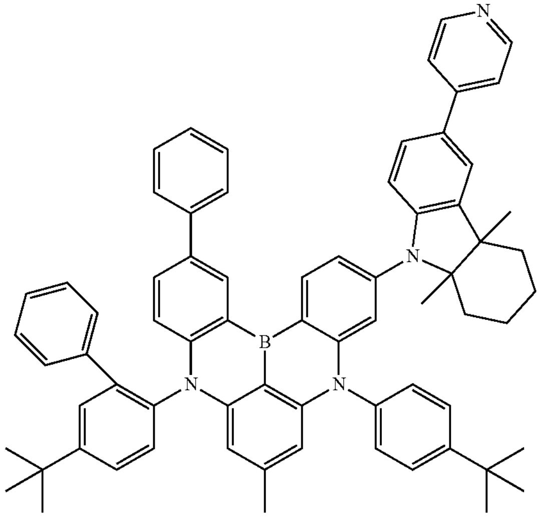
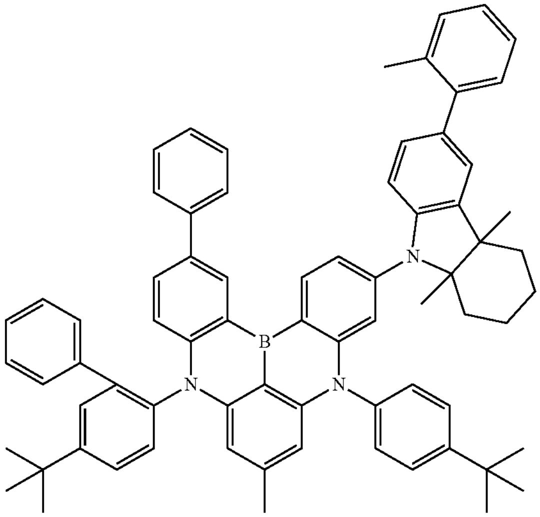
-continued
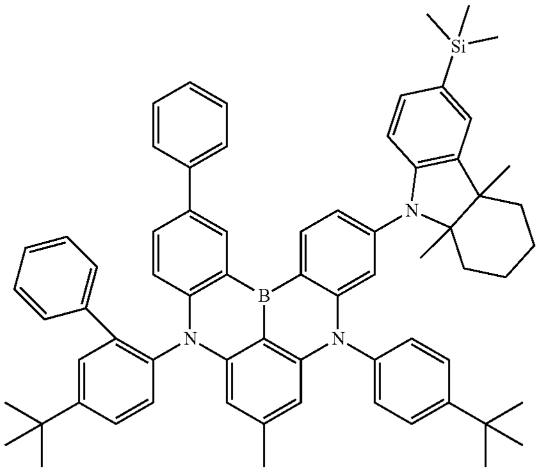
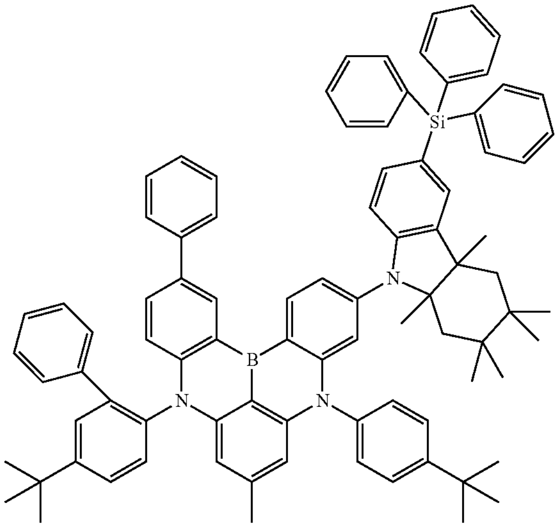
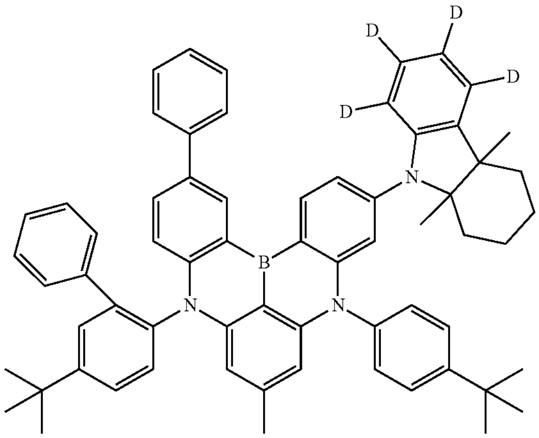

-continued
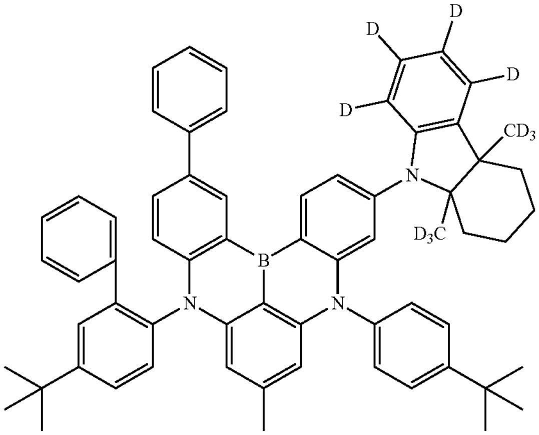
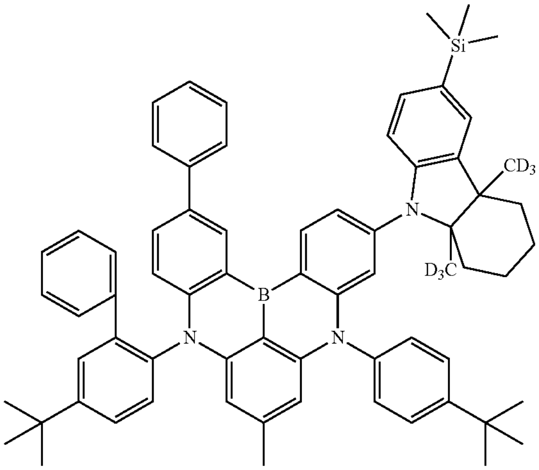
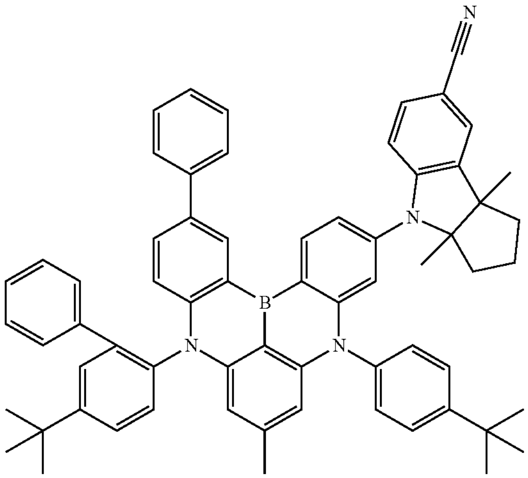
-continued
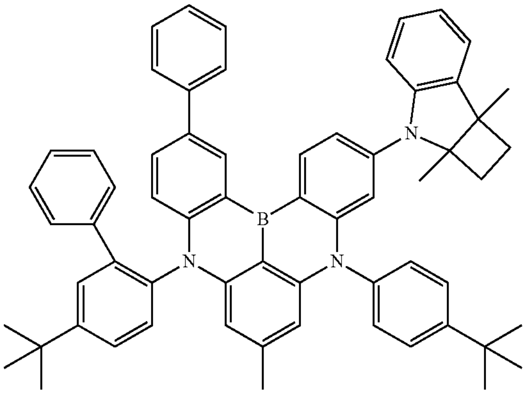
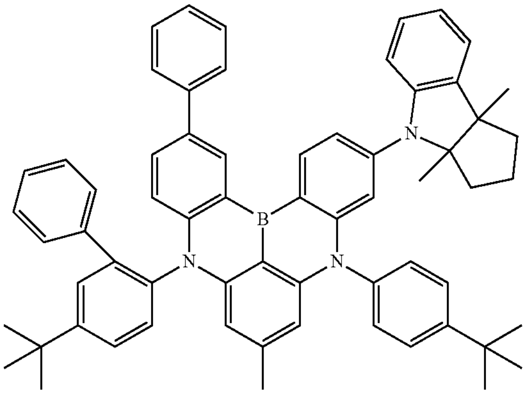
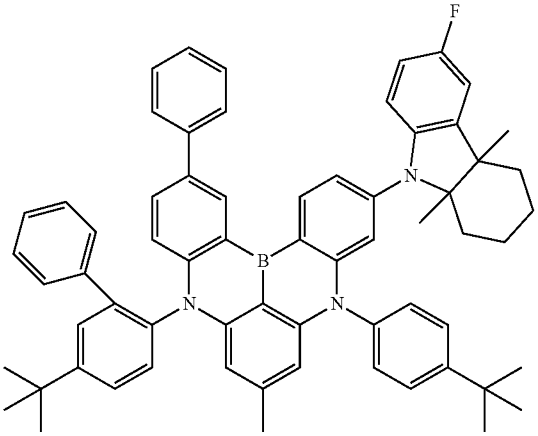

-continued
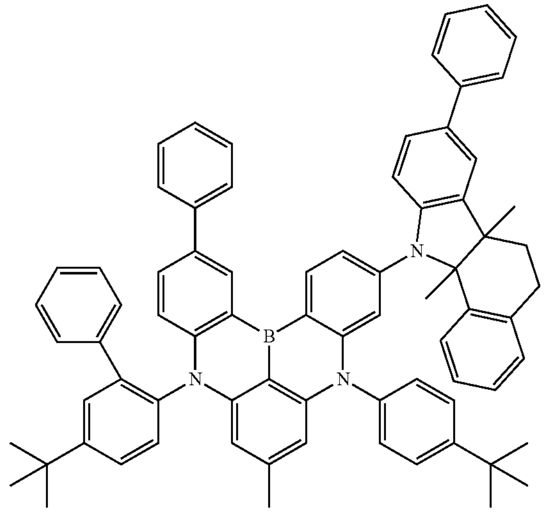
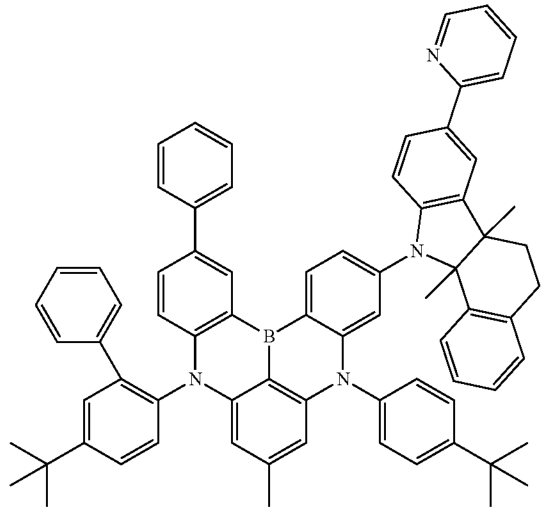
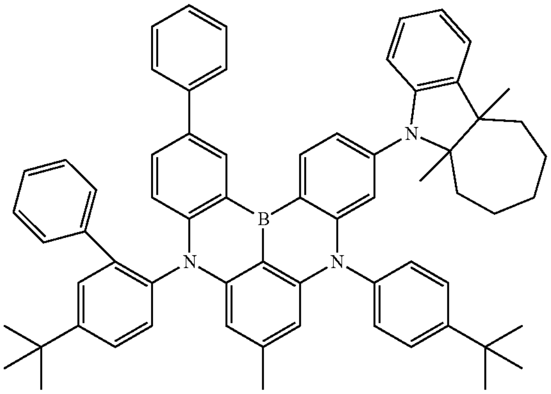
-continued
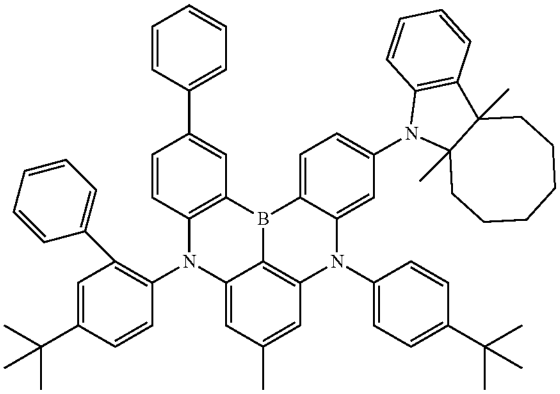
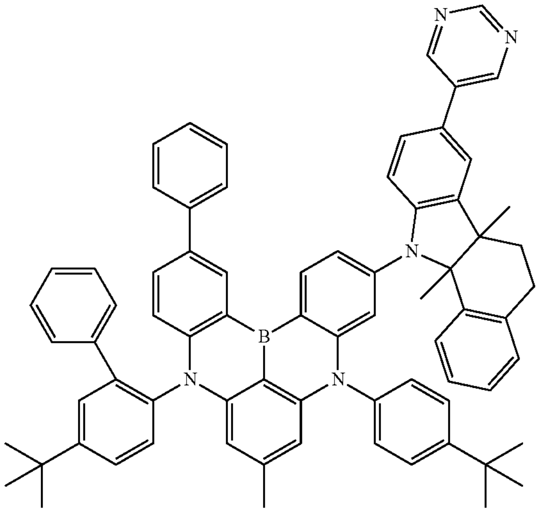
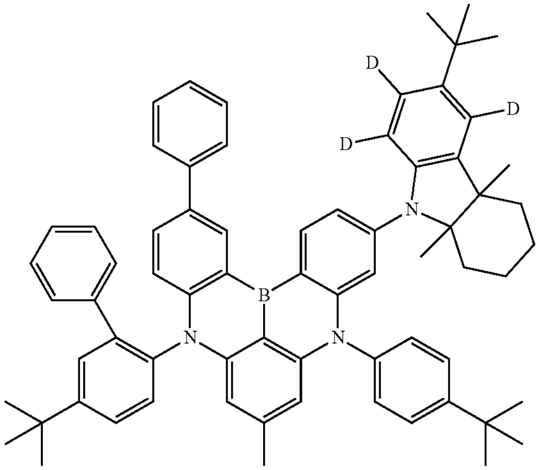

-continued
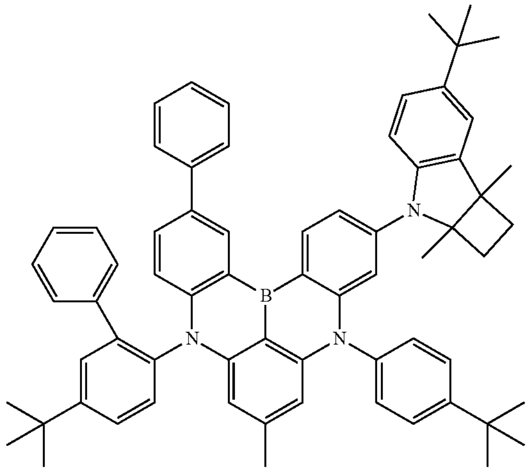
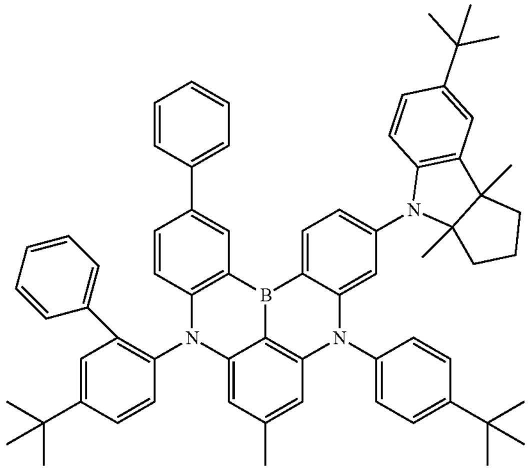
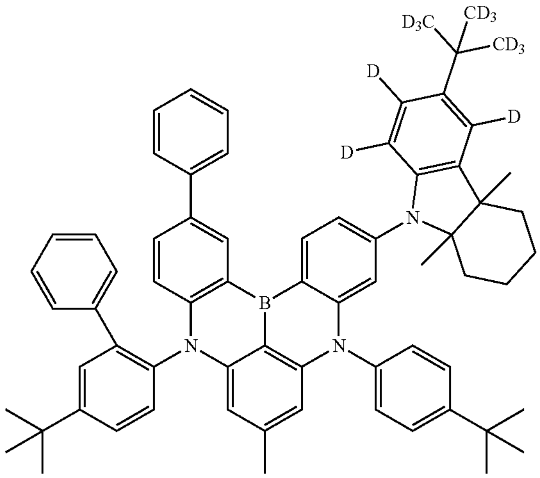
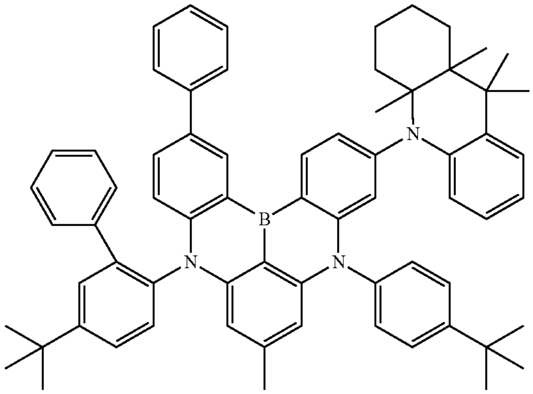
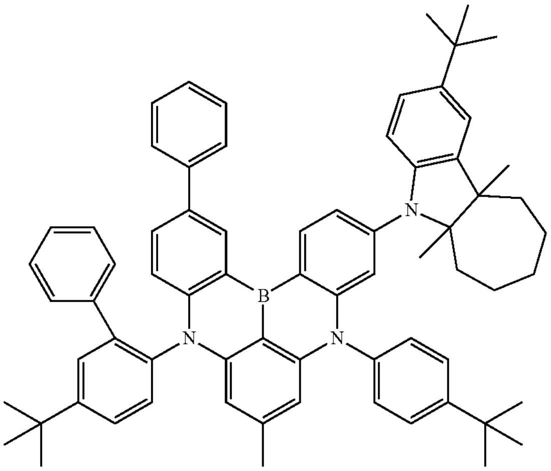
-continued
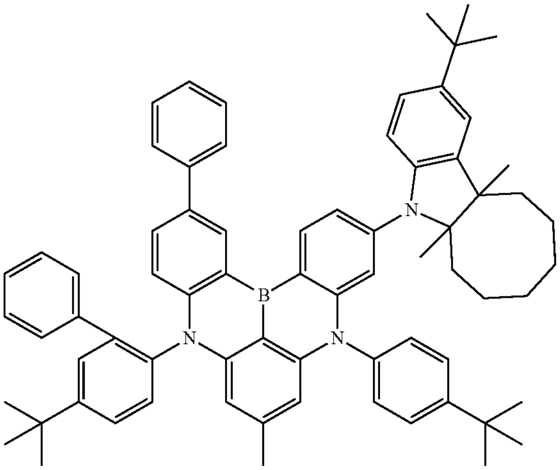

-continued
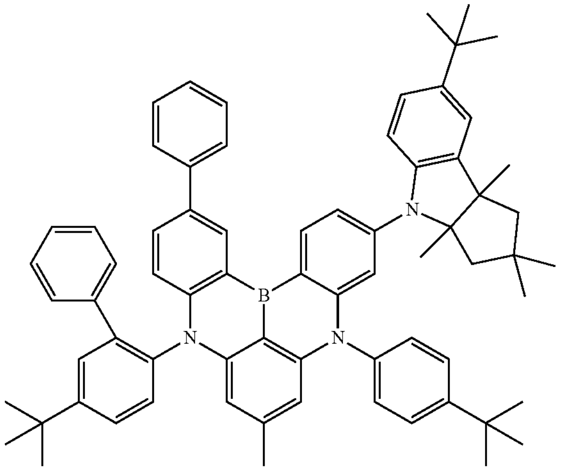
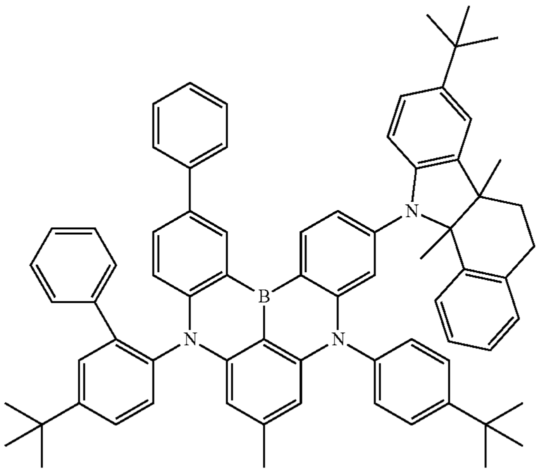
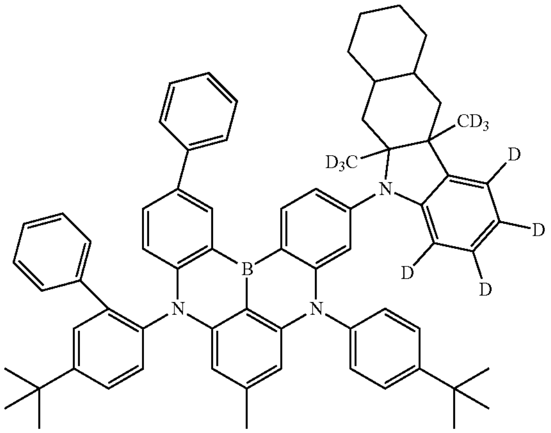
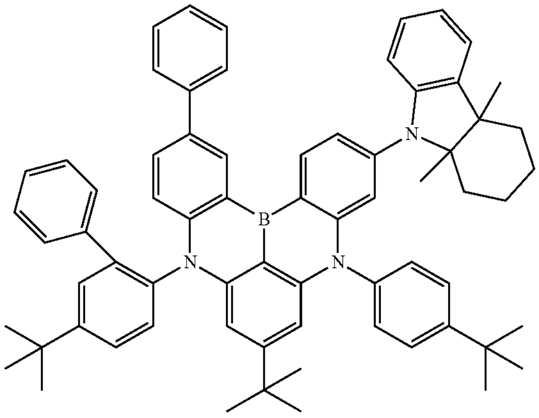
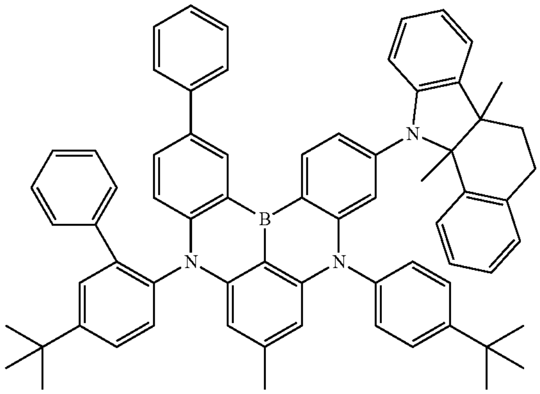
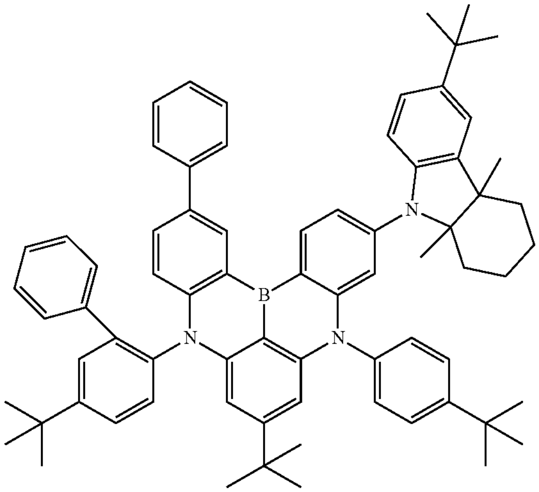
-continued -continued
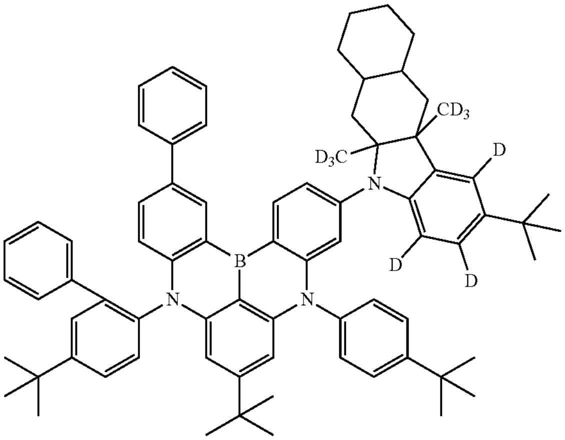
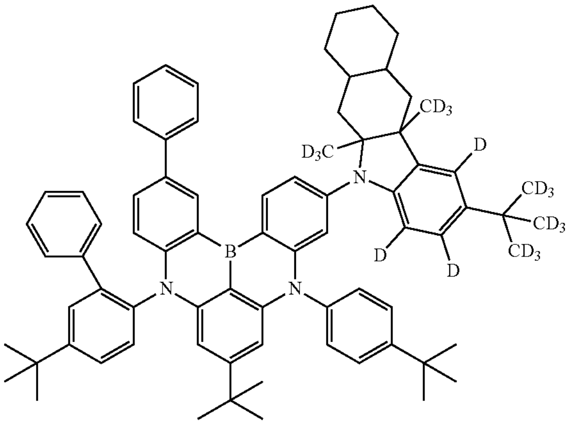
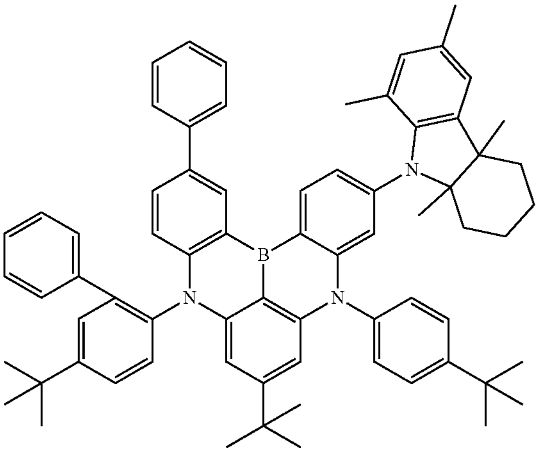
-continued
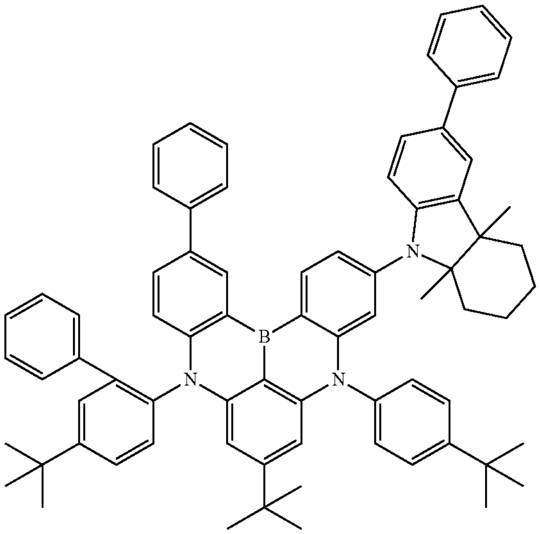
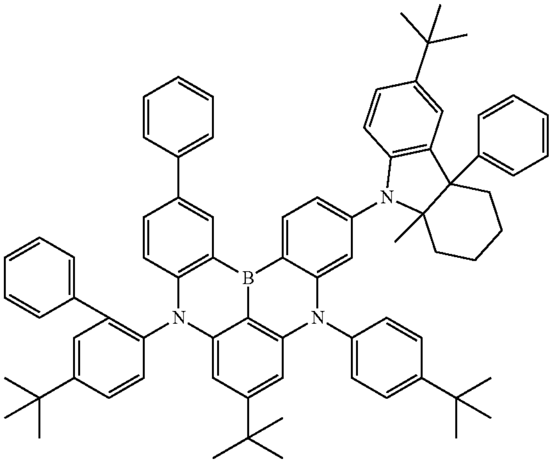
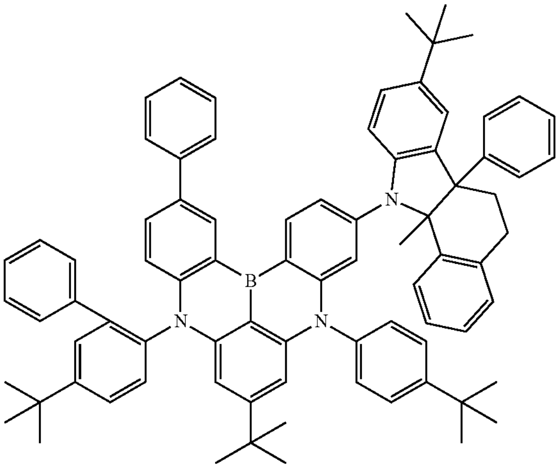

-continued
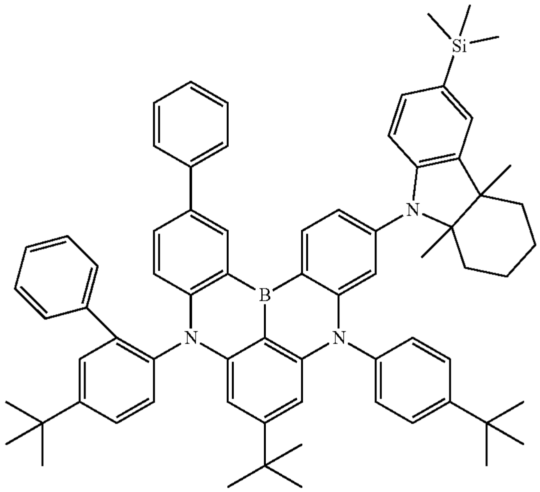
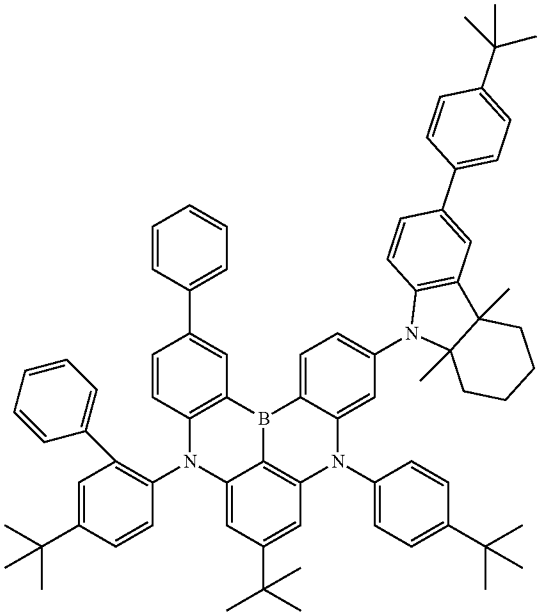
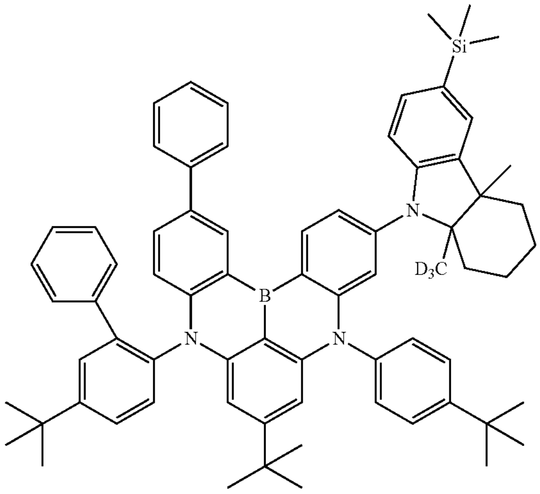
-continued
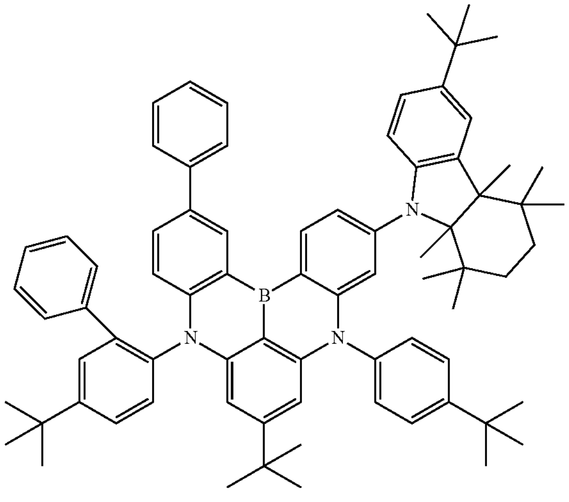
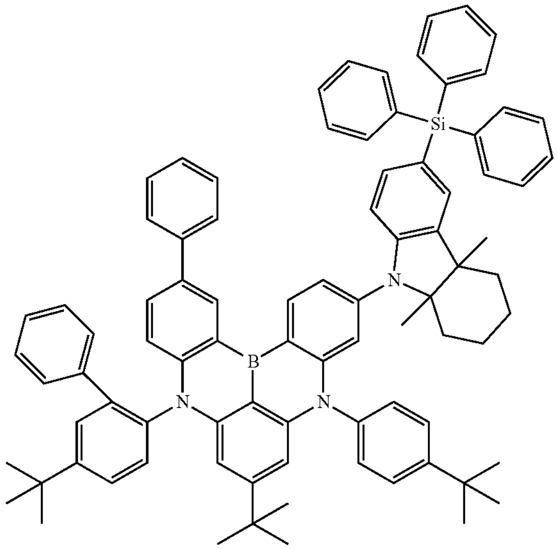
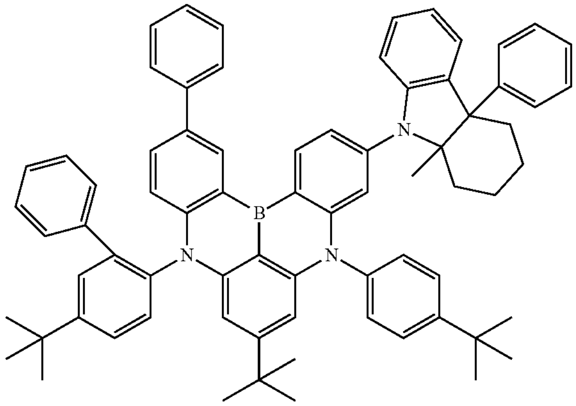

-continued
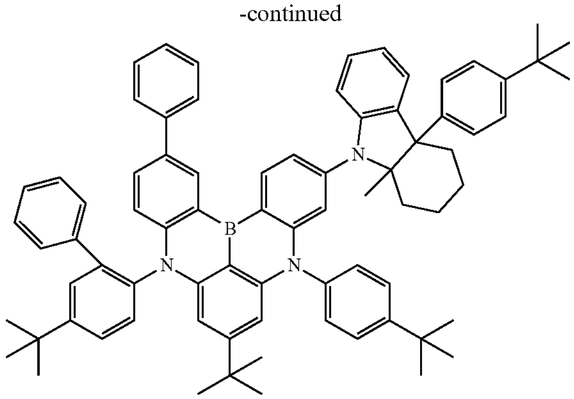
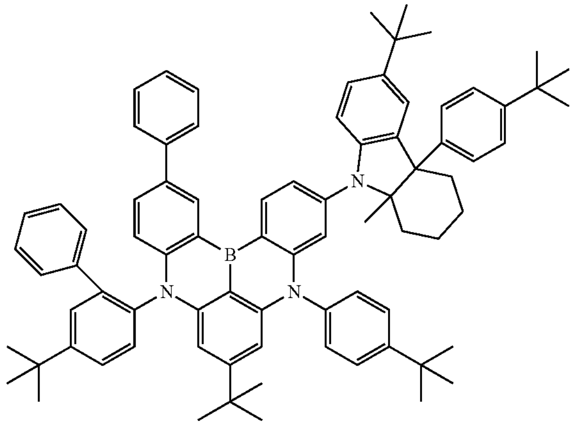
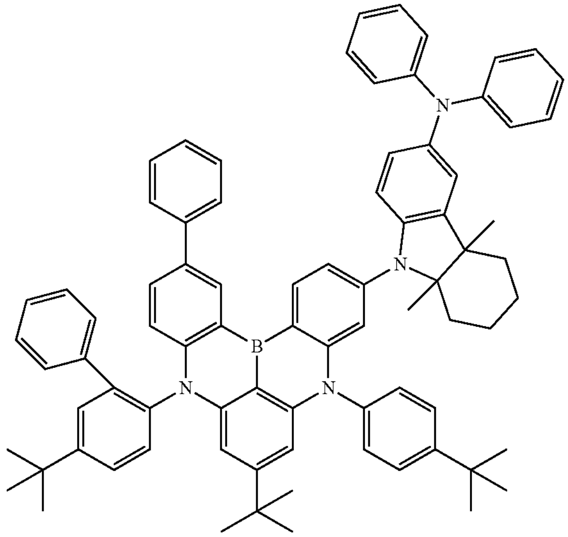
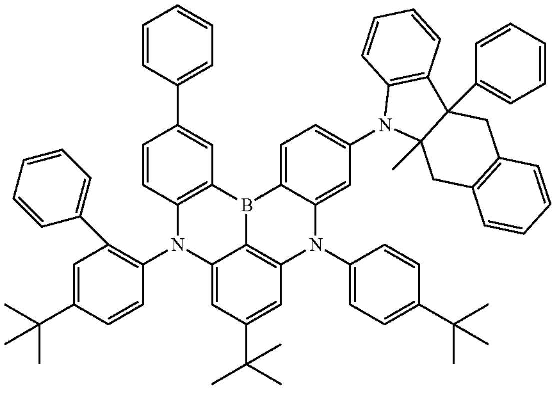
-continued
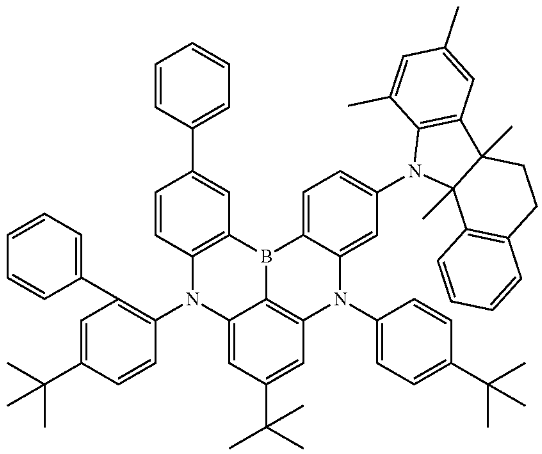
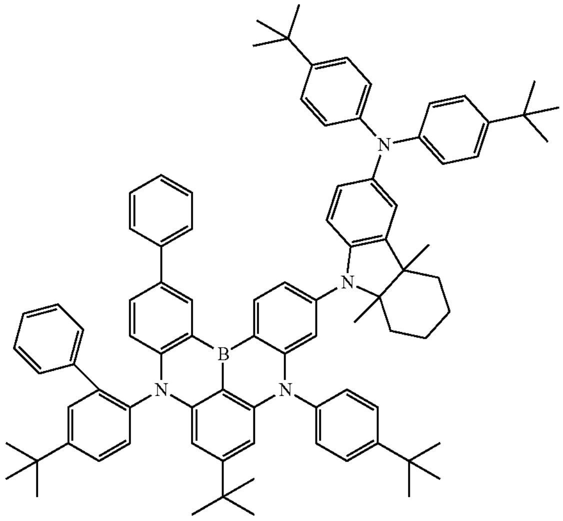
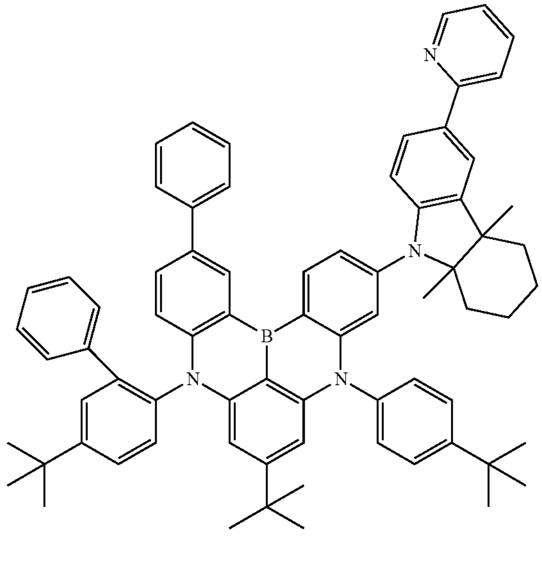

-continued
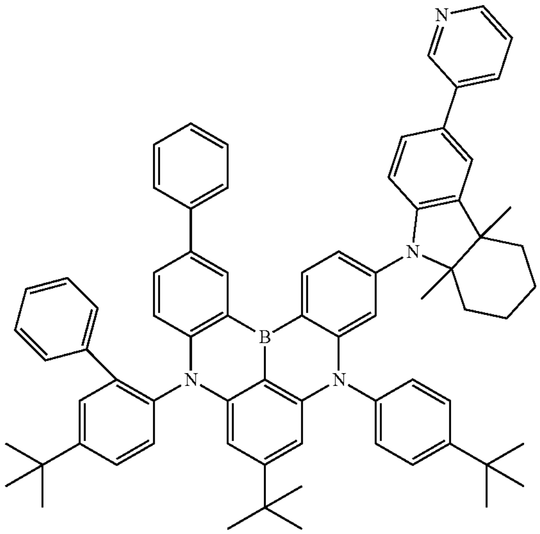
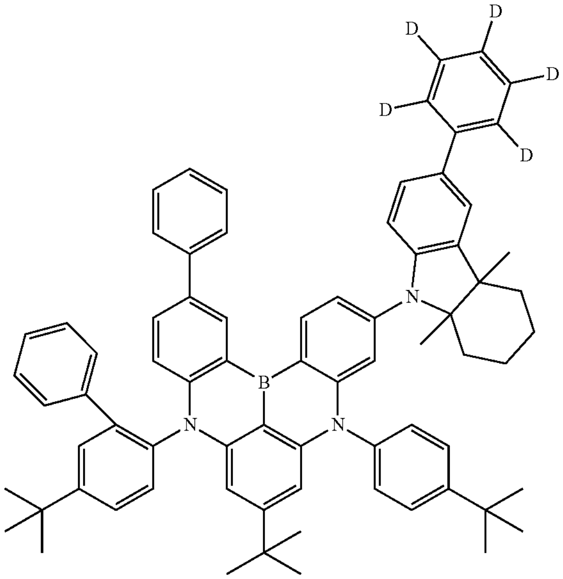
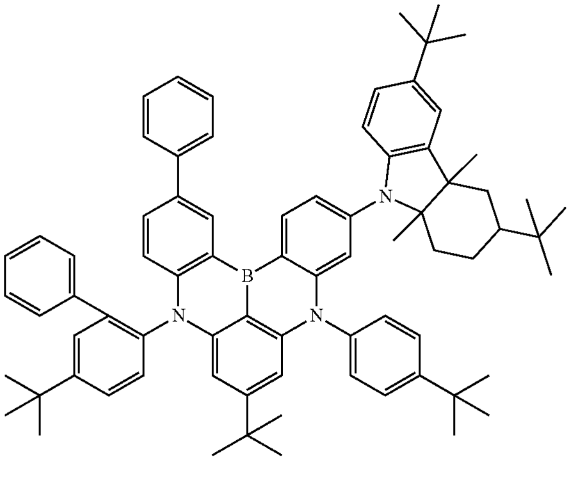
-continued
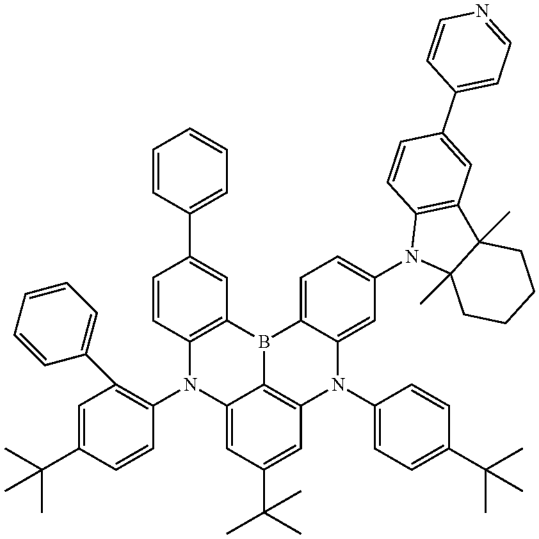
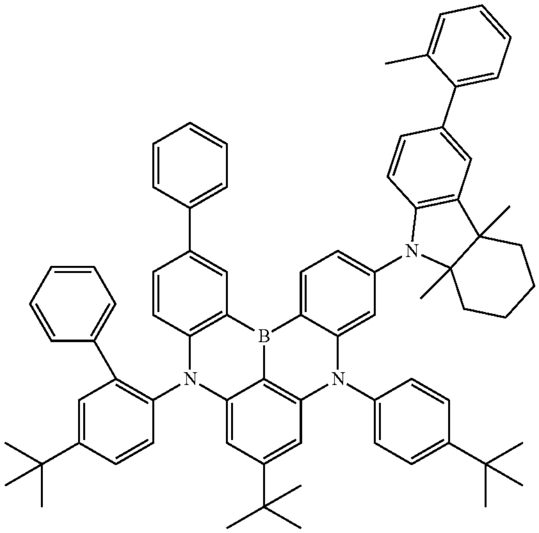
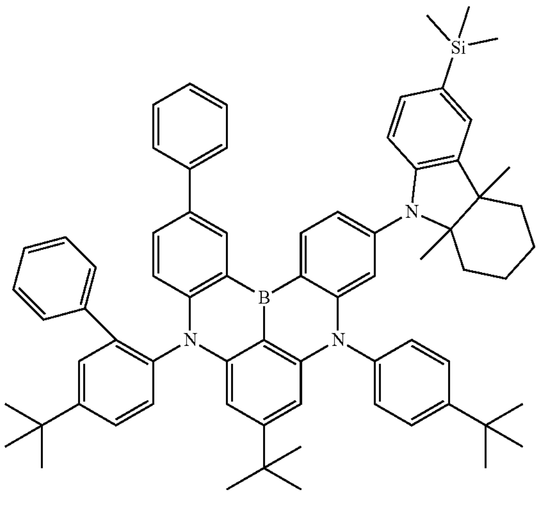

-continued
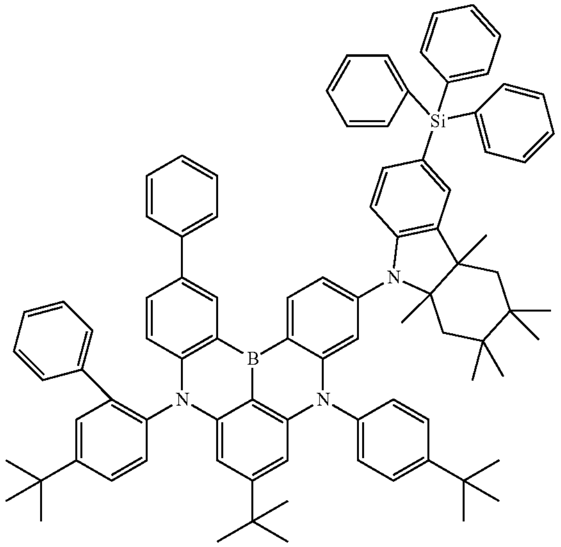
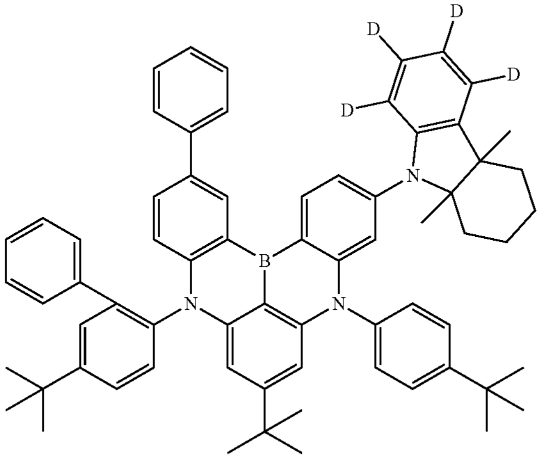
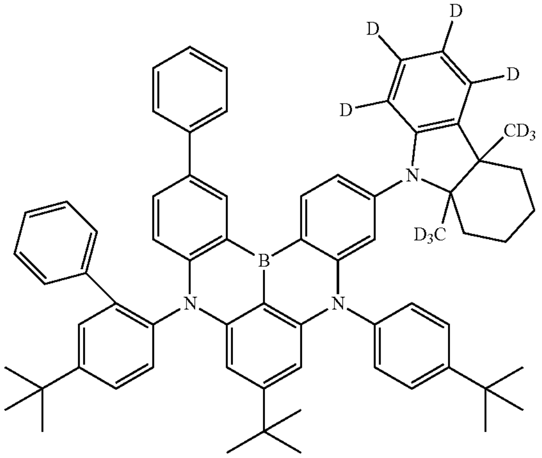
-continued
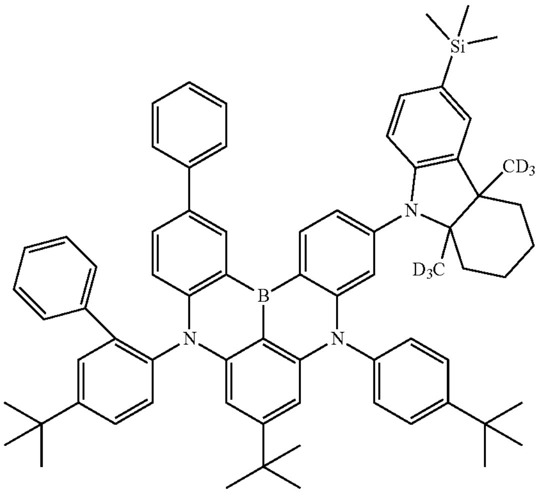
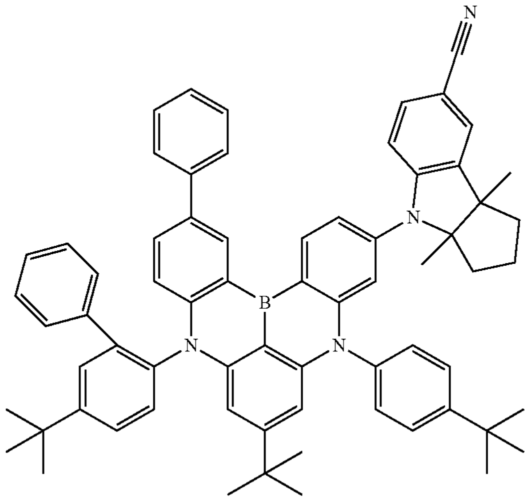
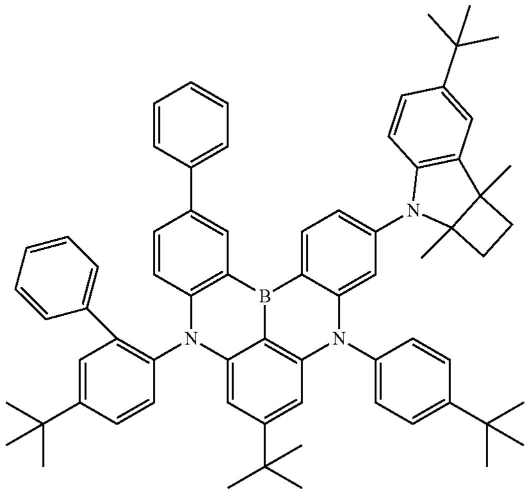

-continued
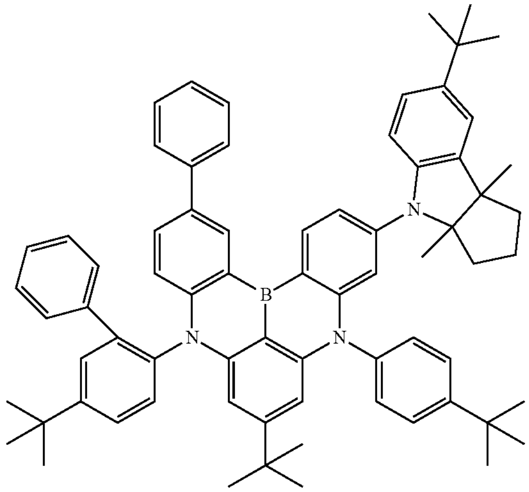
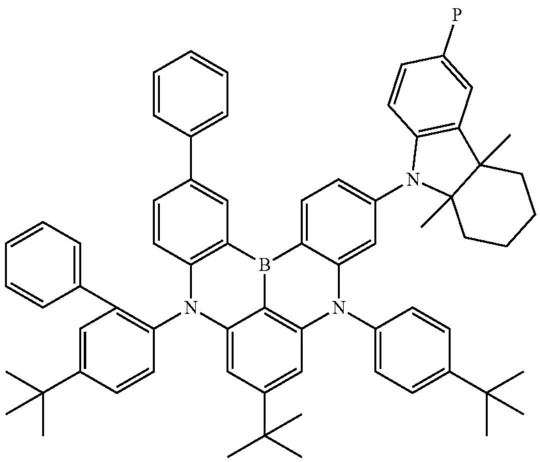
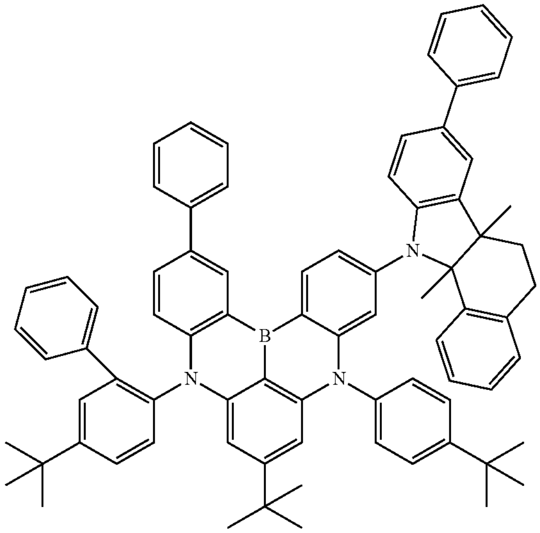
-continued
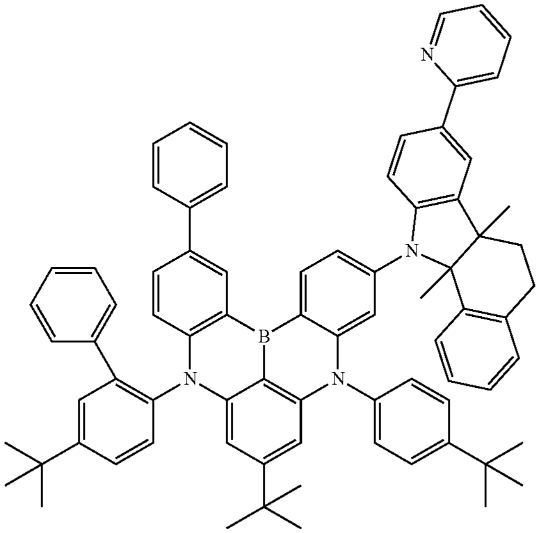
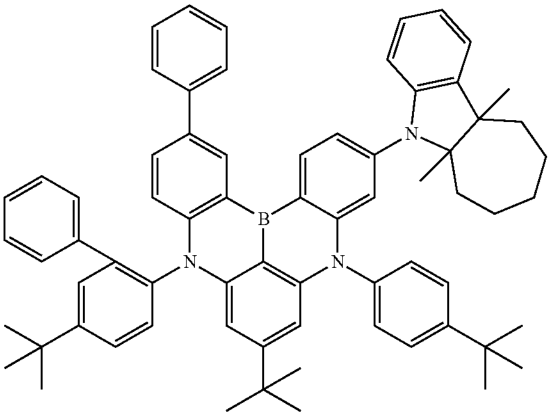
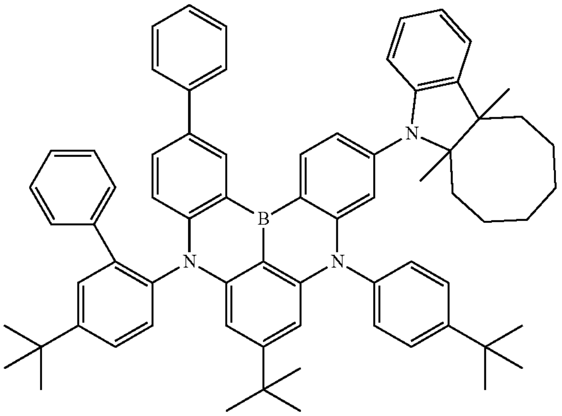

-continued
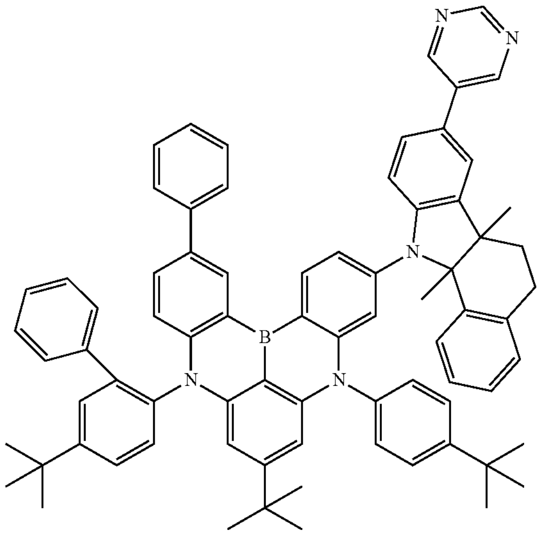
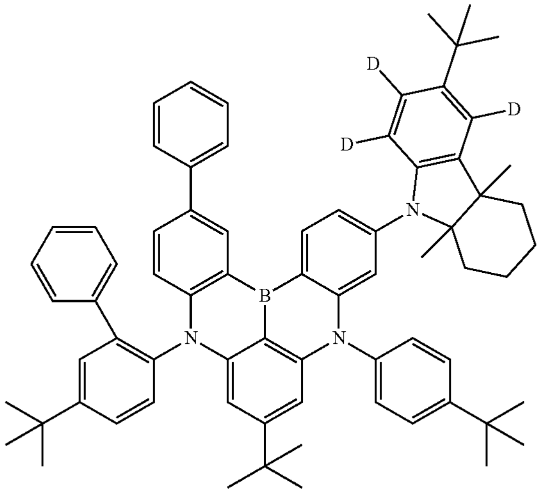
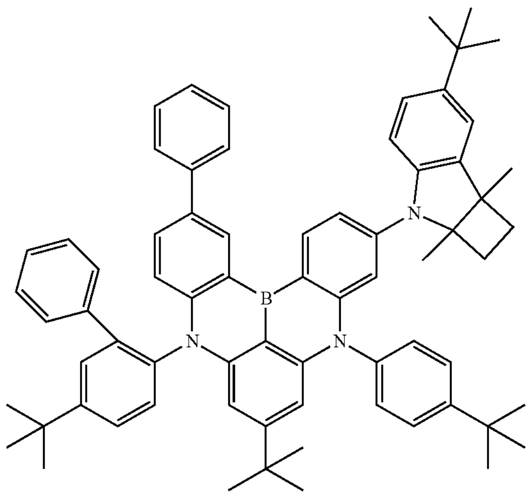
-continued
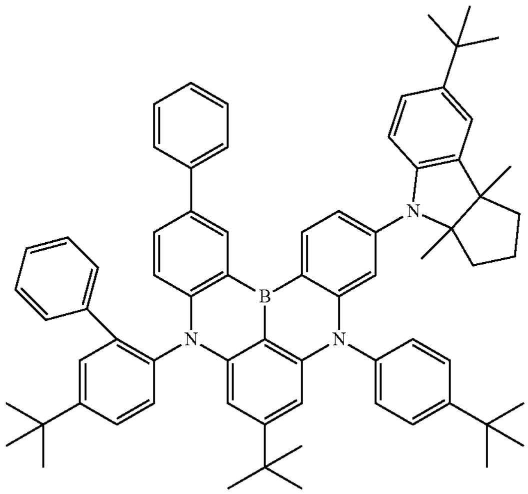
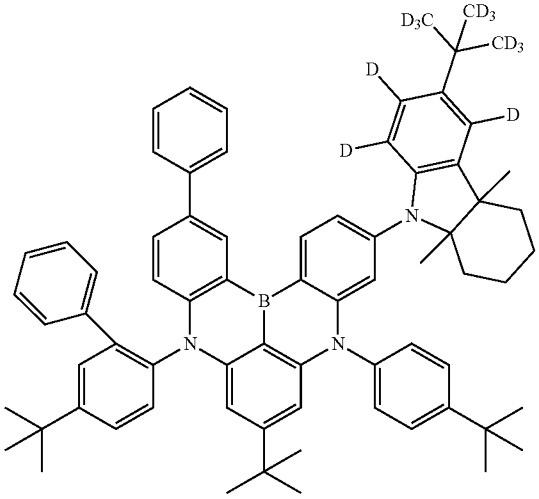
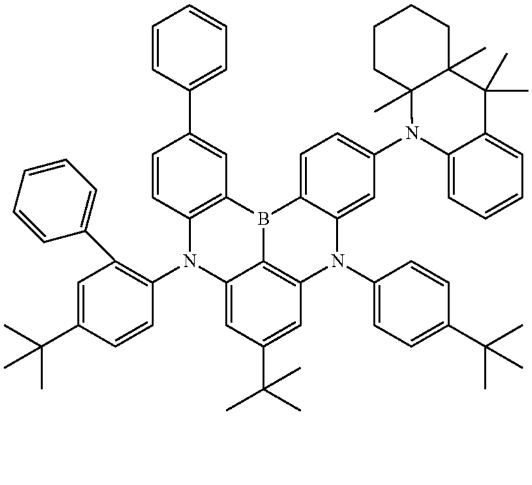

-continued
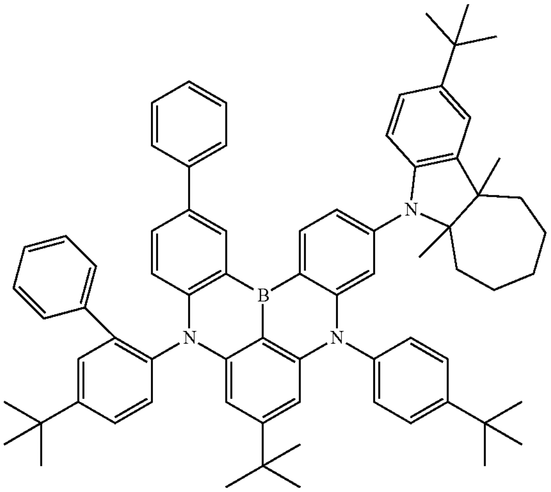
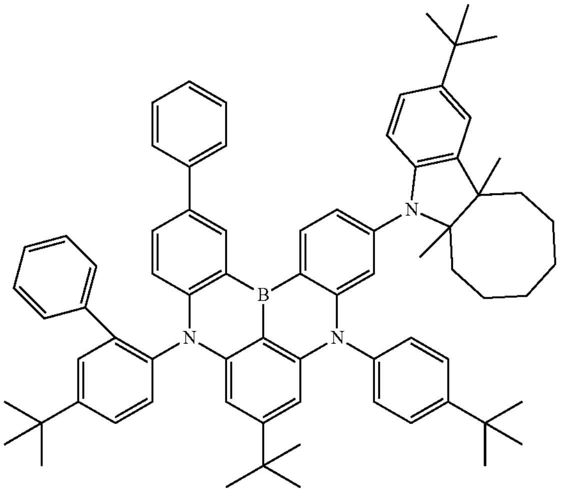
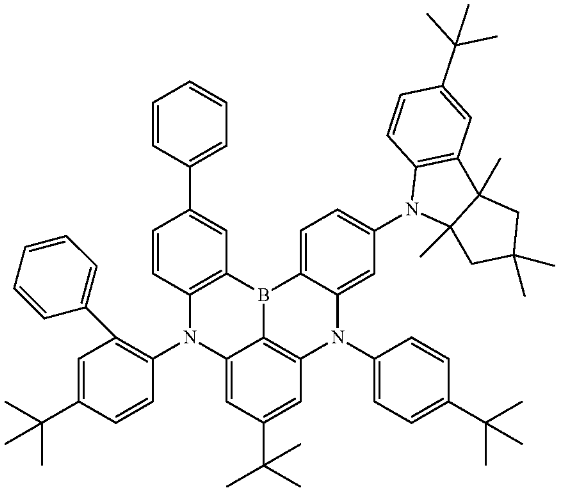
-continued
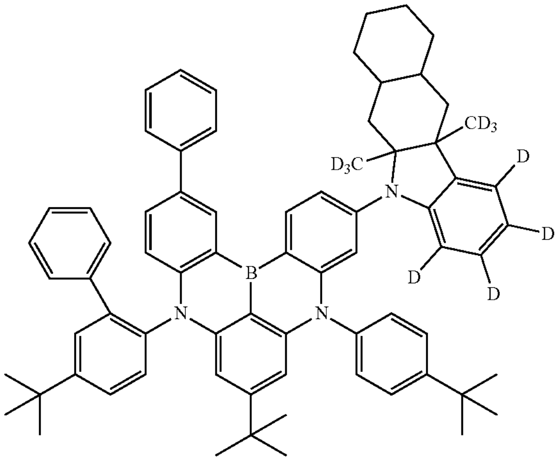
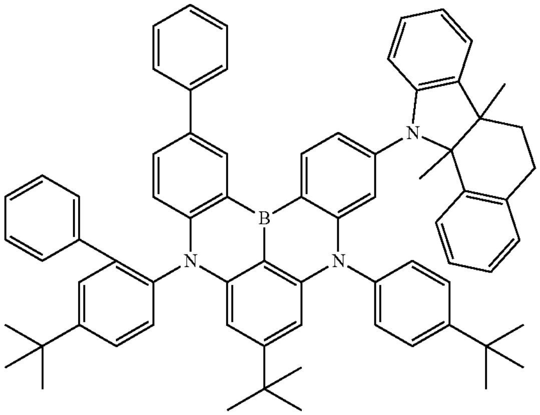
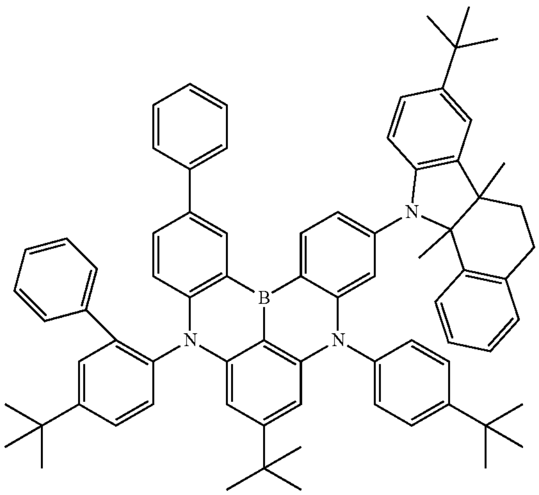

-continued
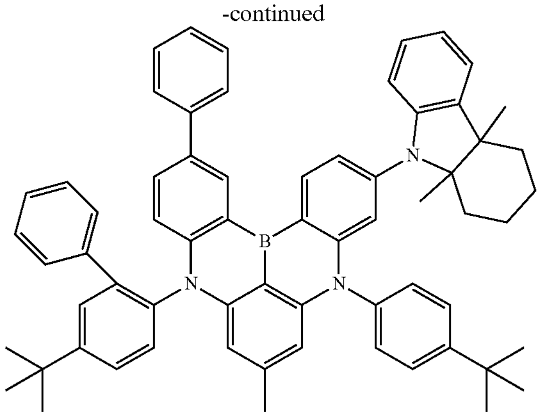
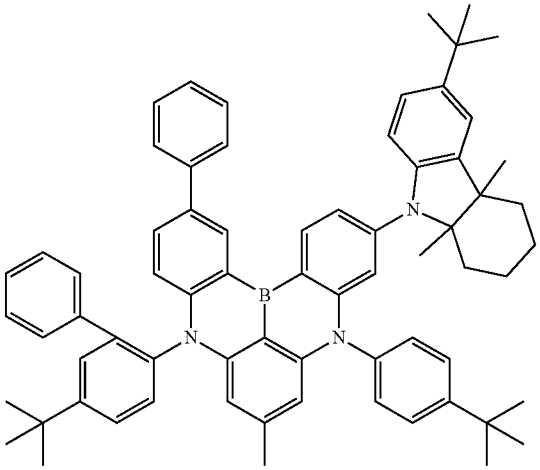
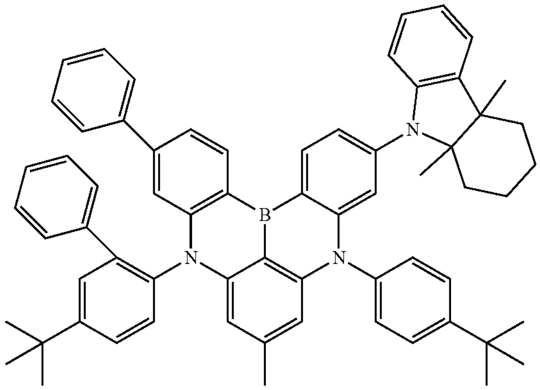
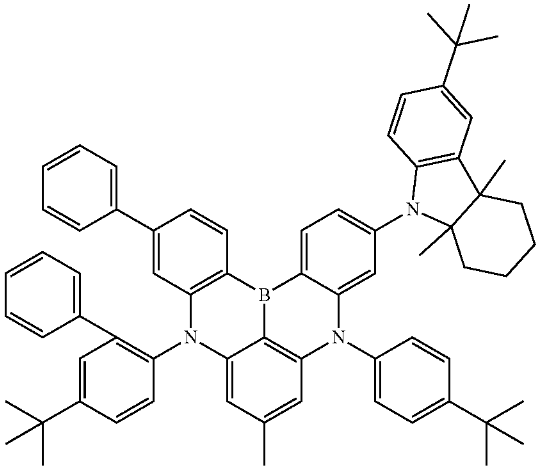
-continued
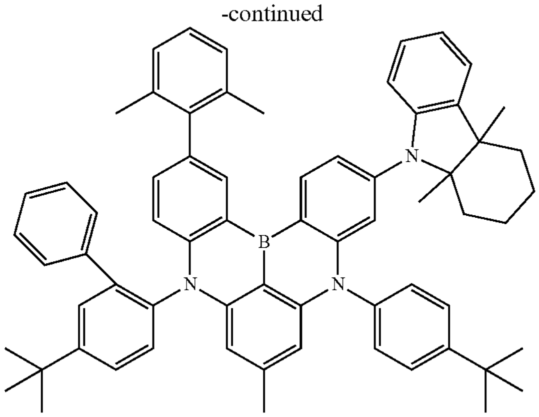
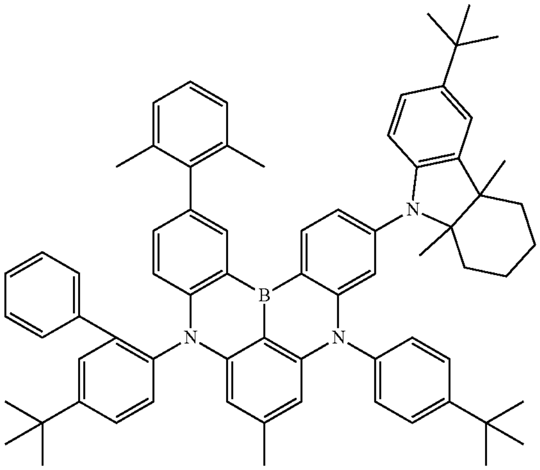
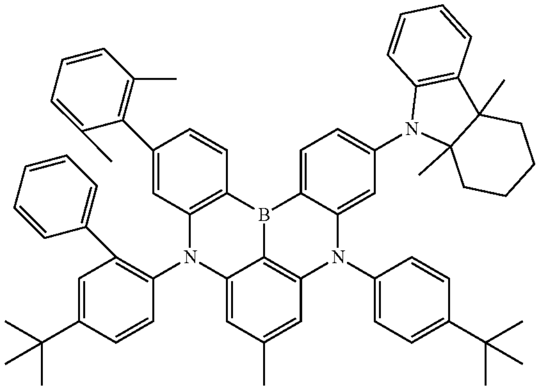
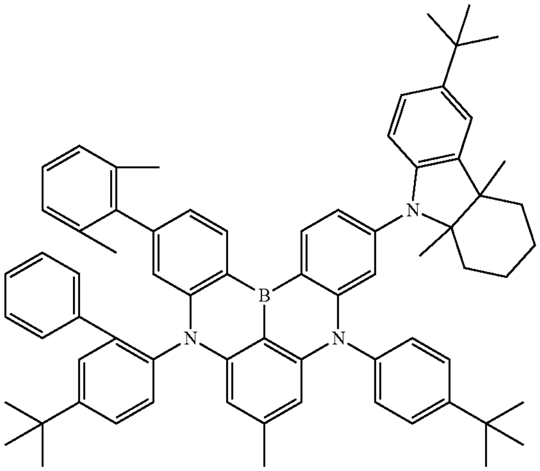

-continued
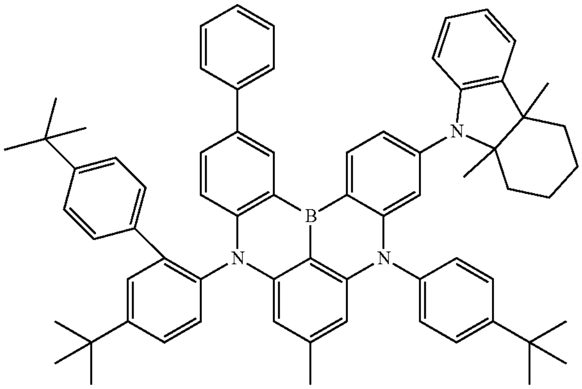
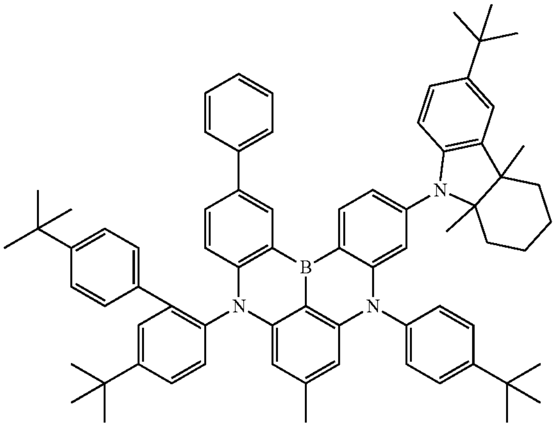
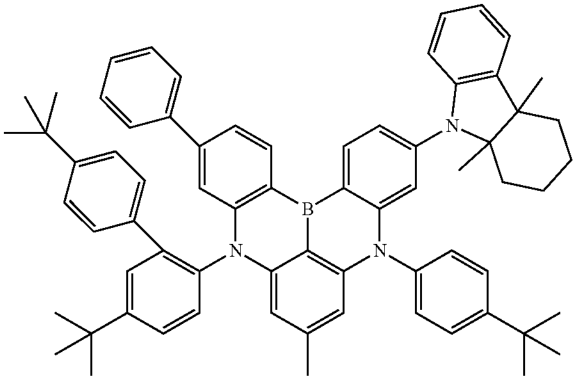
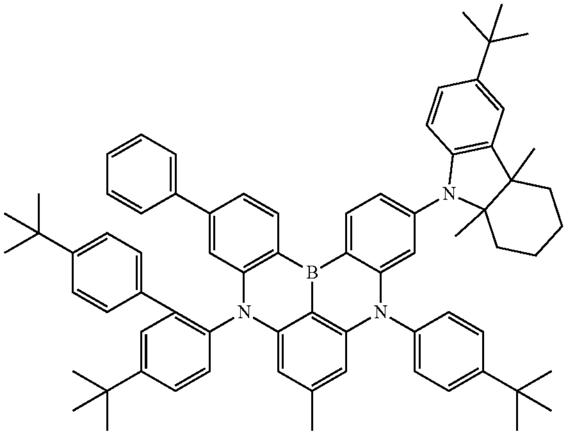
-continued
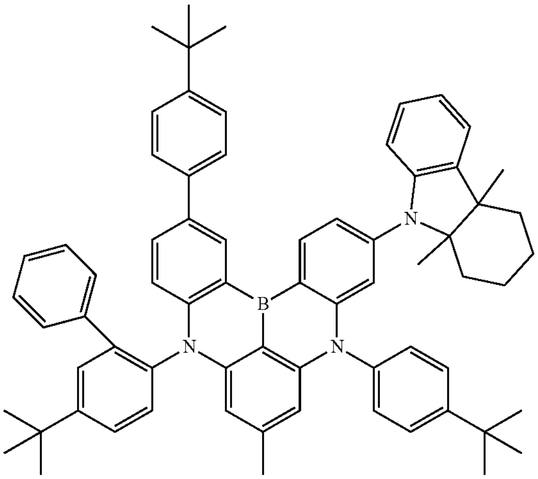
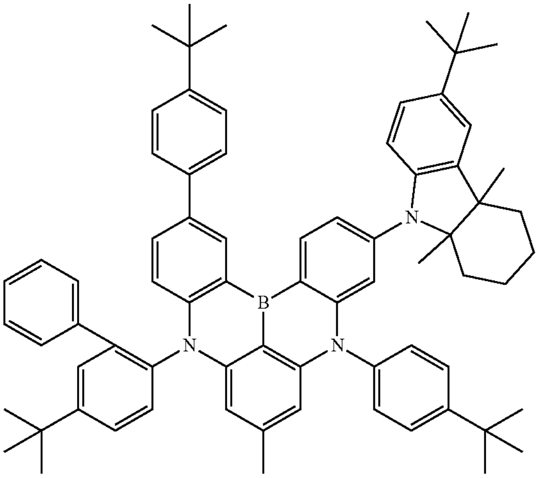
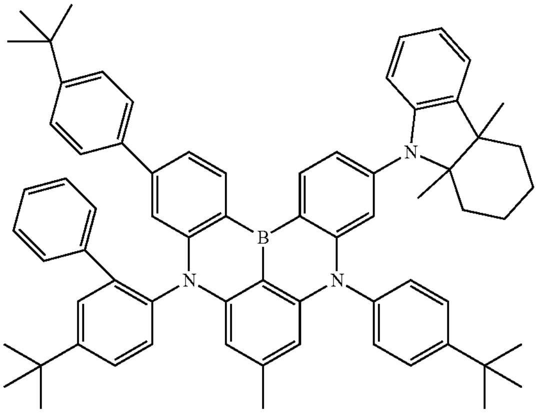

-continued
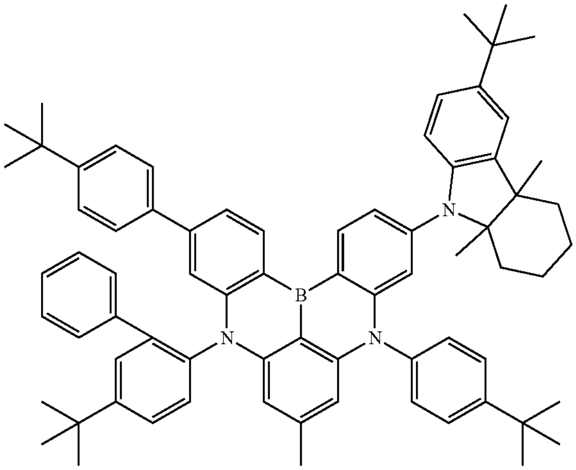
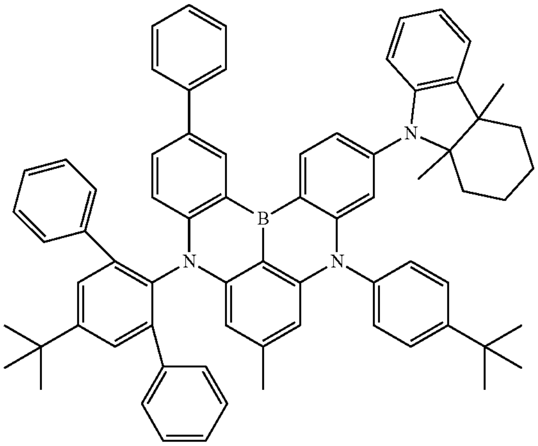
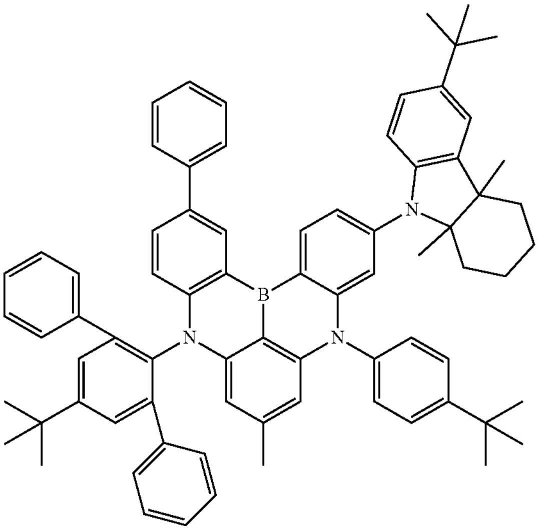
-continued
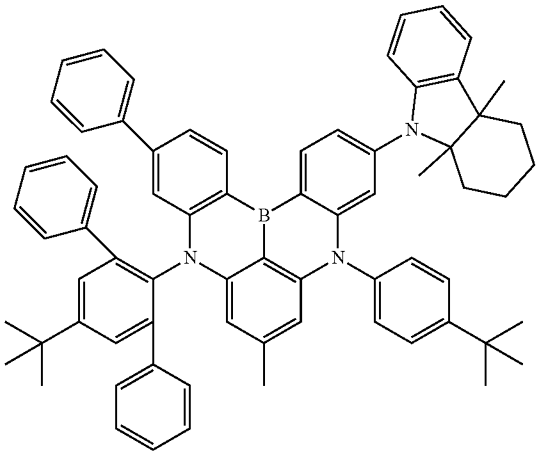
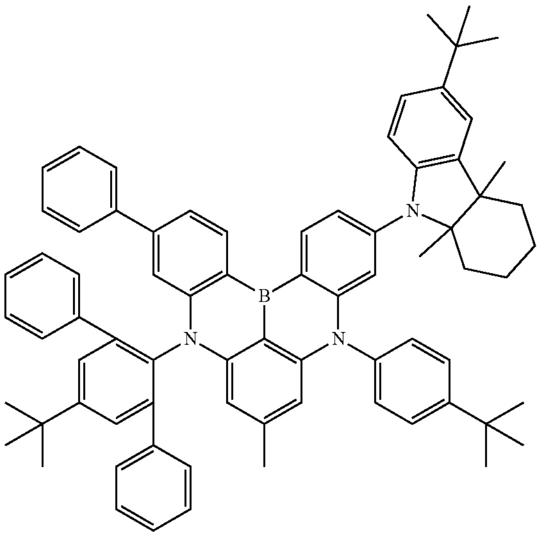
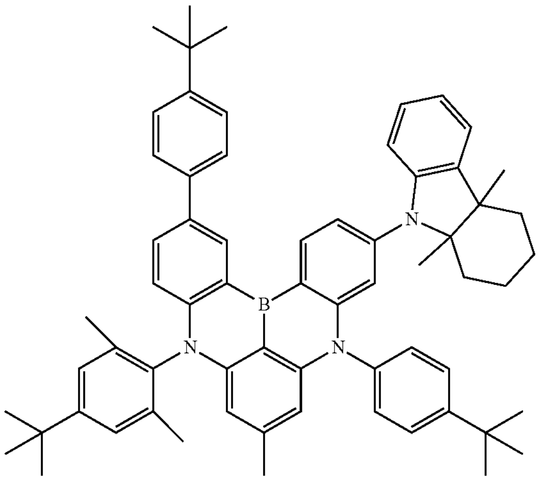

-continued
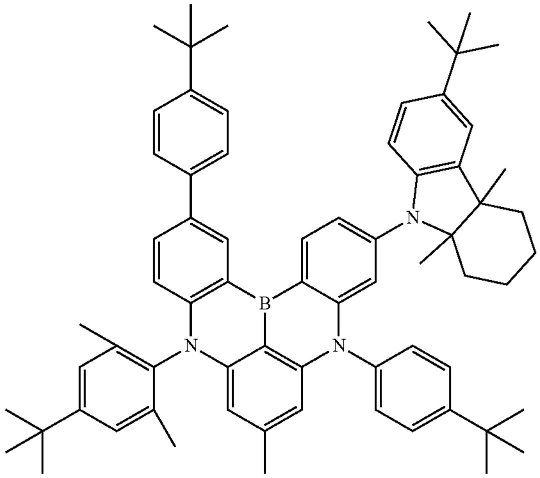
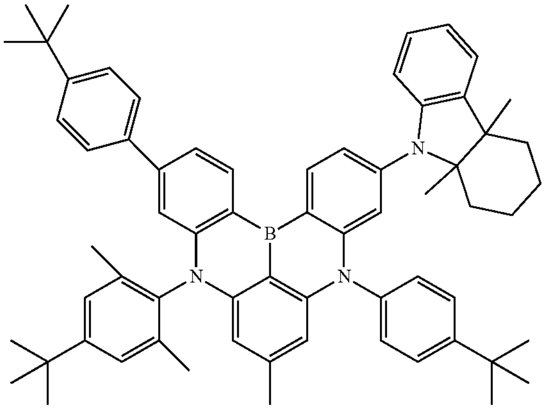
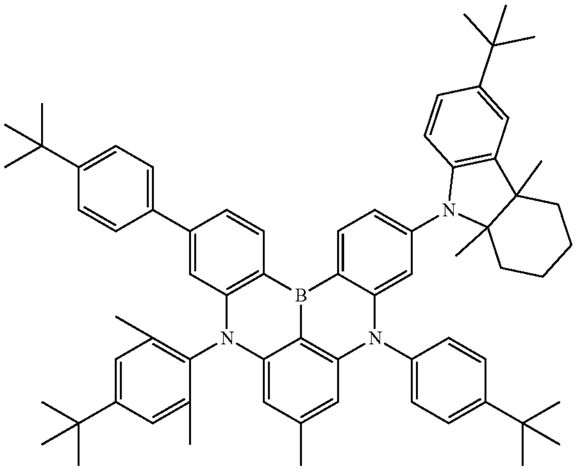
-continued
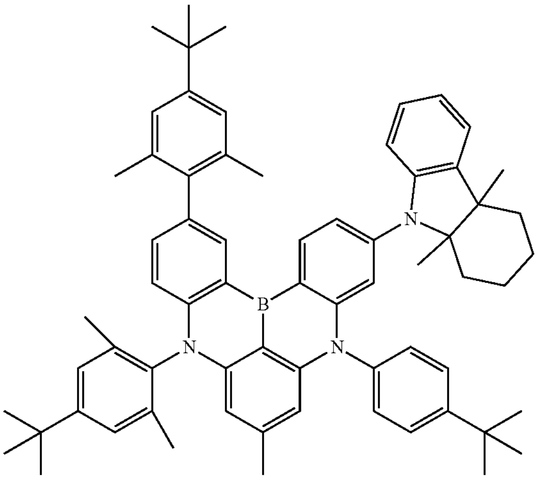
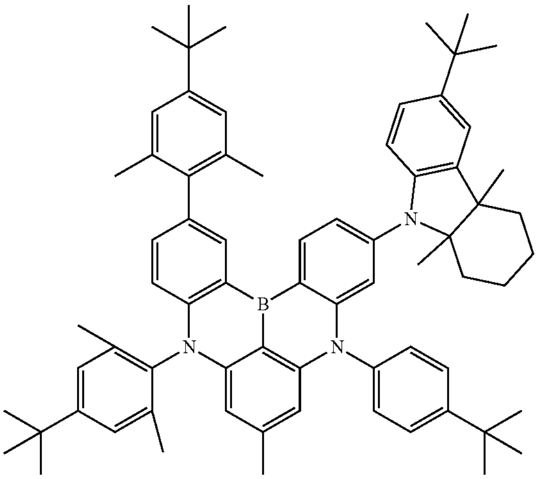
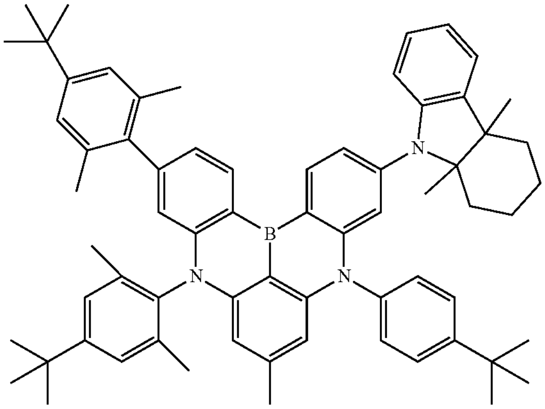

-continued
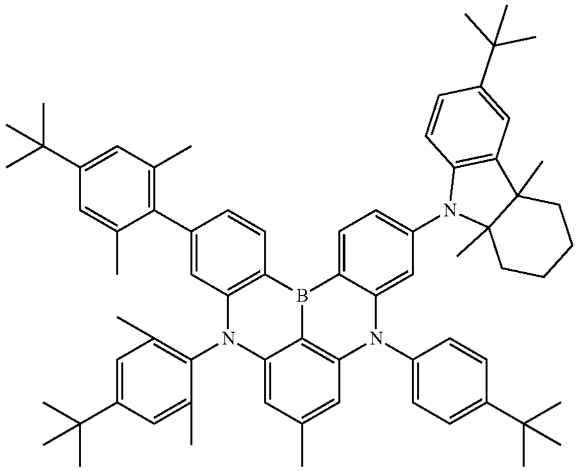
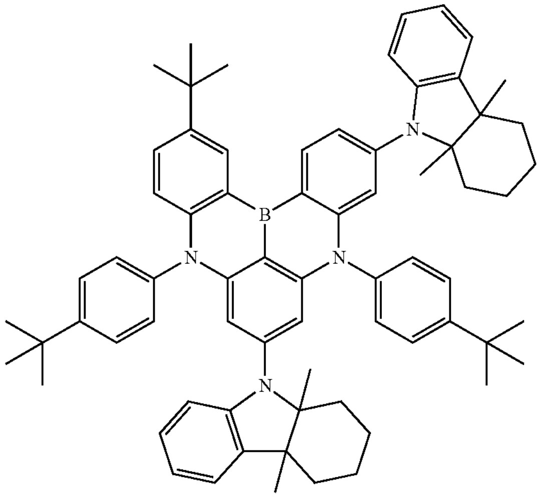
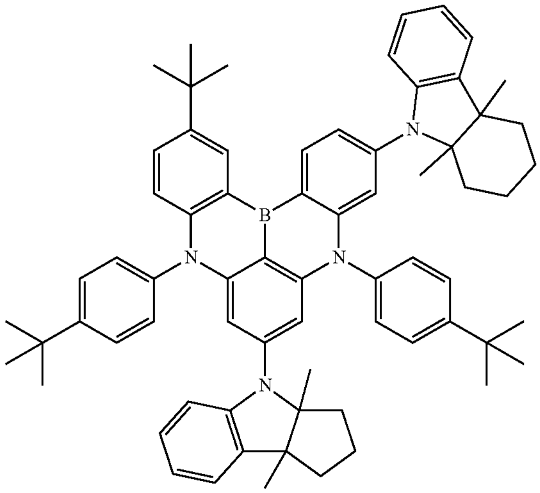
-continued
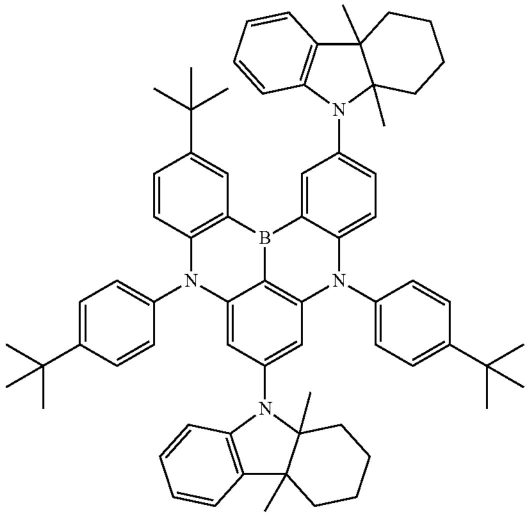
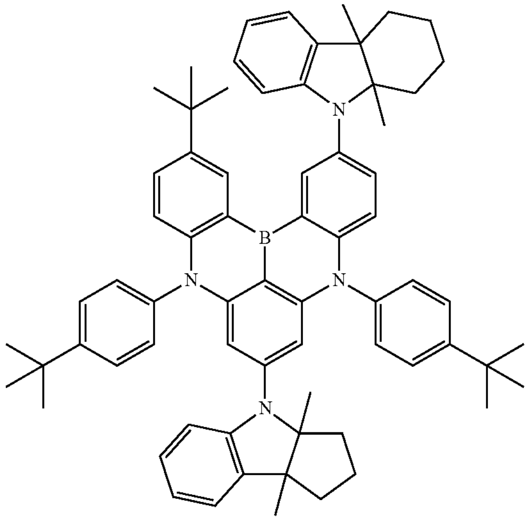
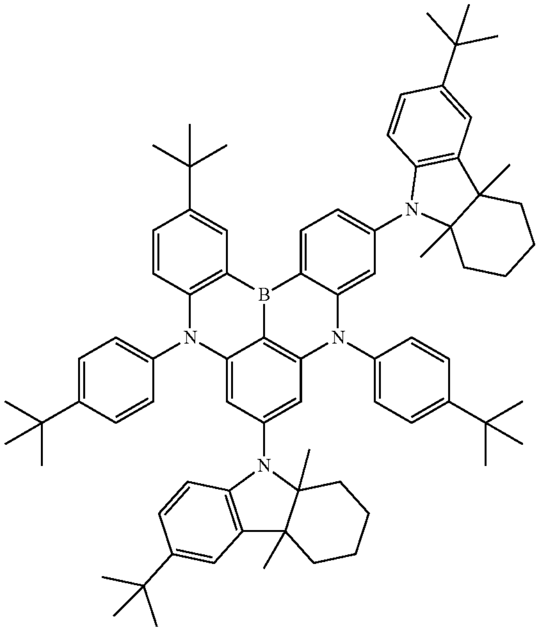

-continued
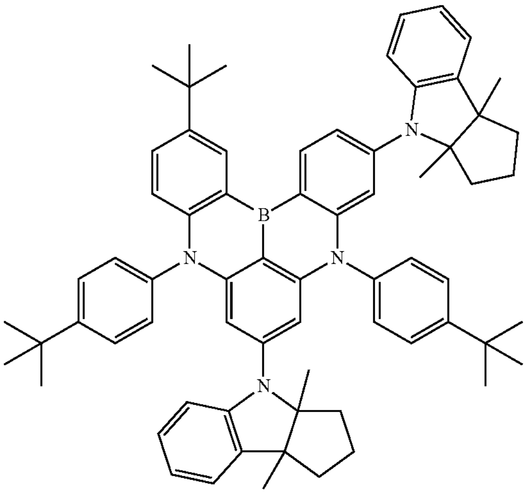
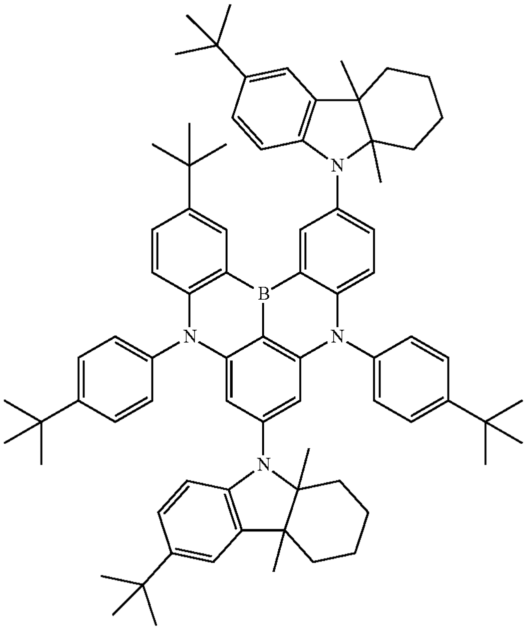
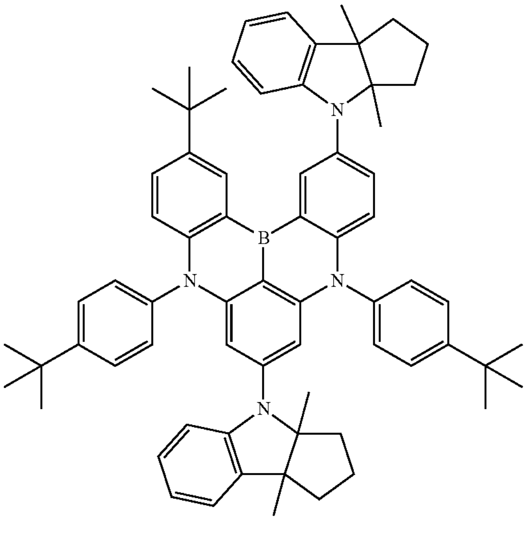
-continued
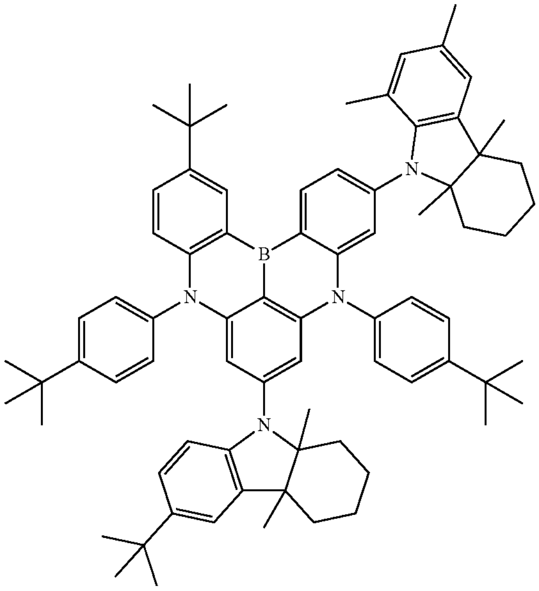
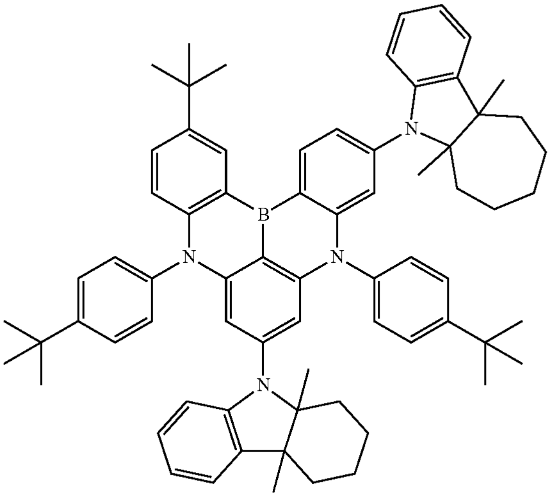
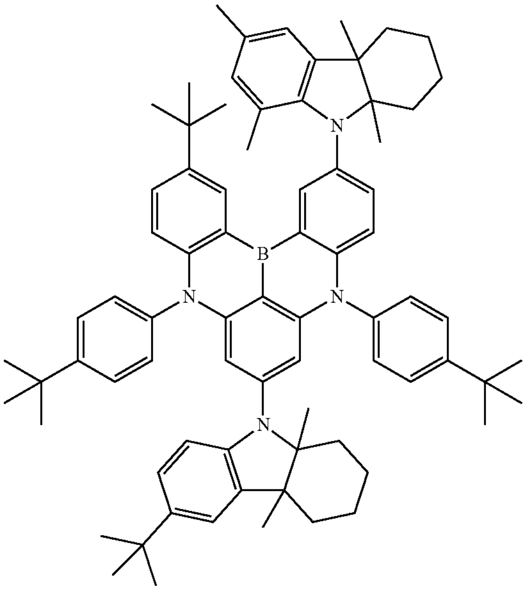

-continued
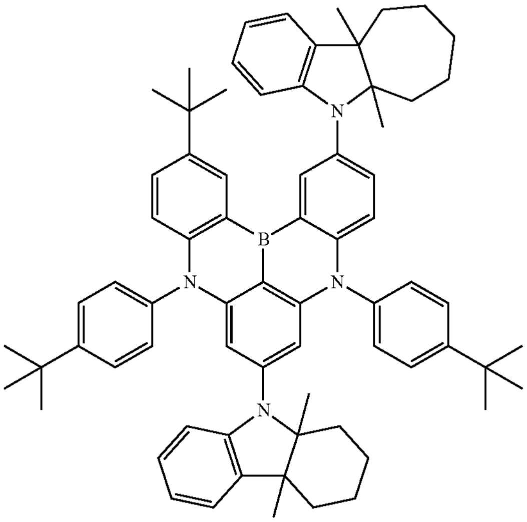
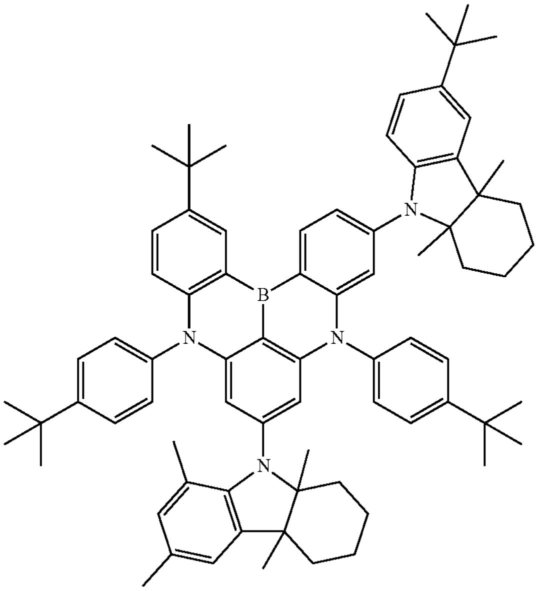
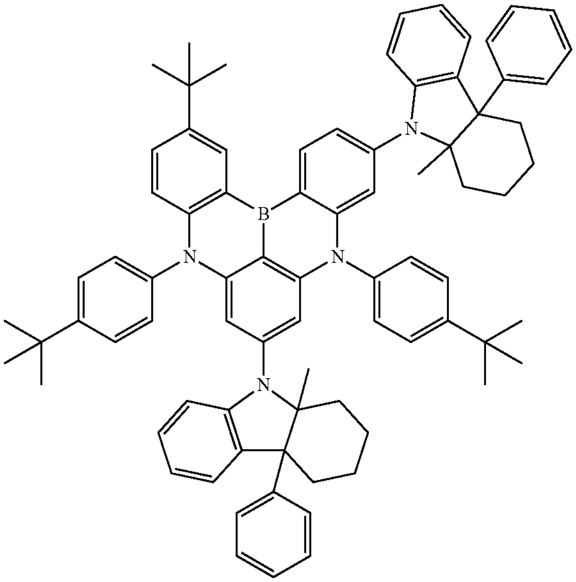
-continued
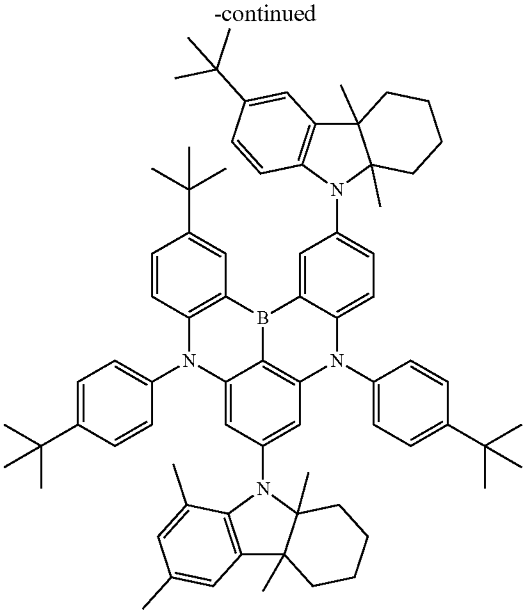
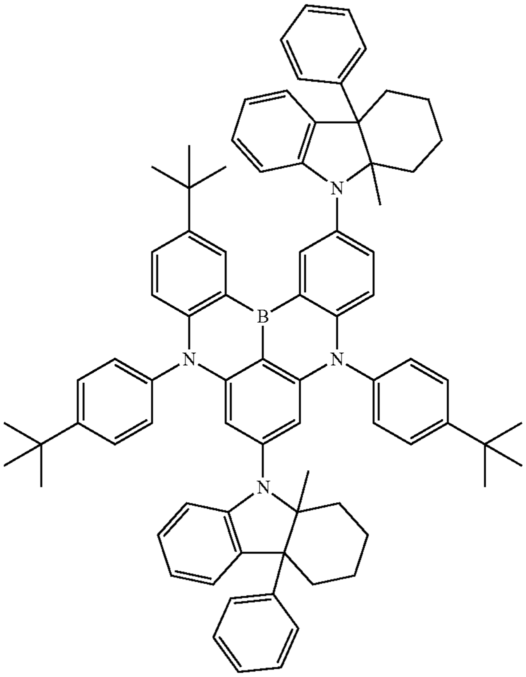 [SMILES: CC(C)(C)c1ccc(N2c3ccc(N4c5ccccc5C5(c6ccccc6)CCCCC45C)cc3B3c4cc(C(C)(C)C)ccc4N(c4ccc(C(C)(C)C)cc4)c4cc(N5c6ccccc6C6(c7ccccc7)CCCCC56C)cc2c43)cc1]

-continued
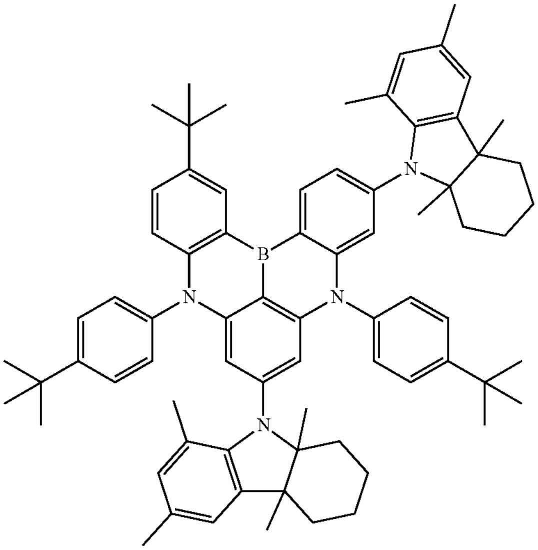
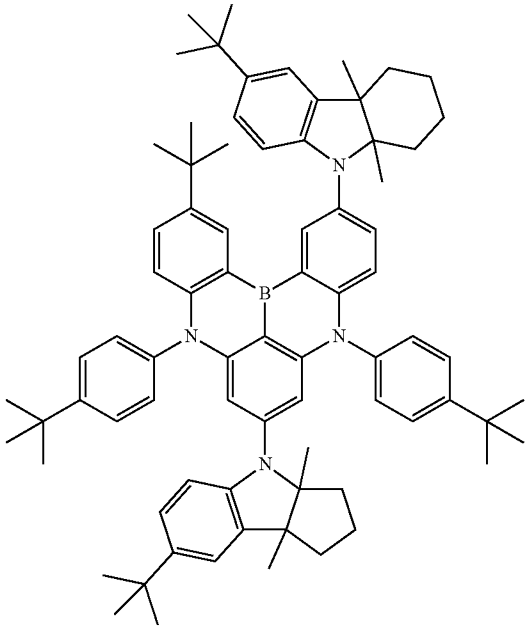
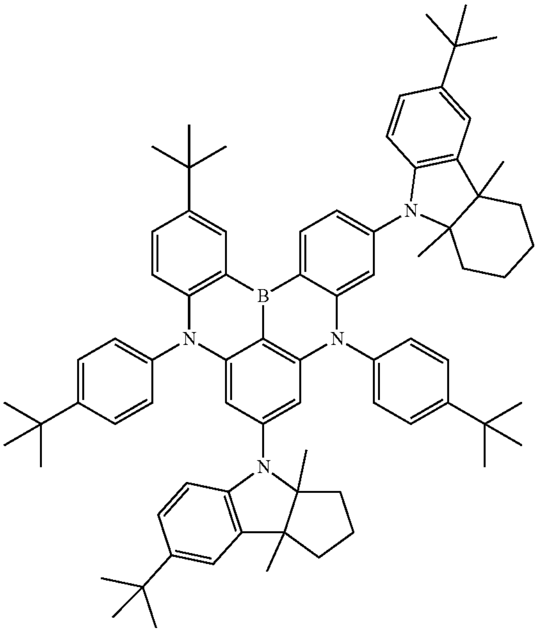
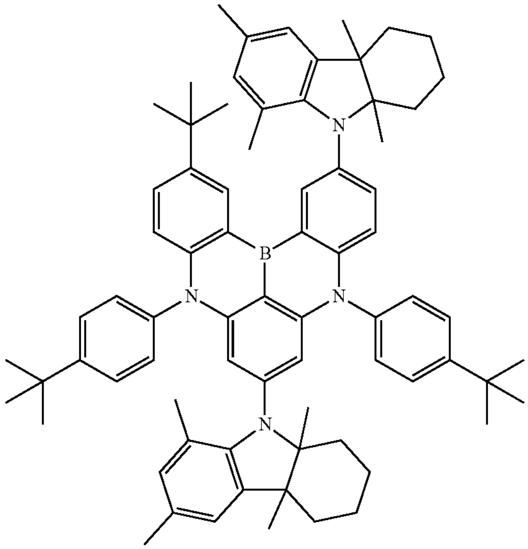
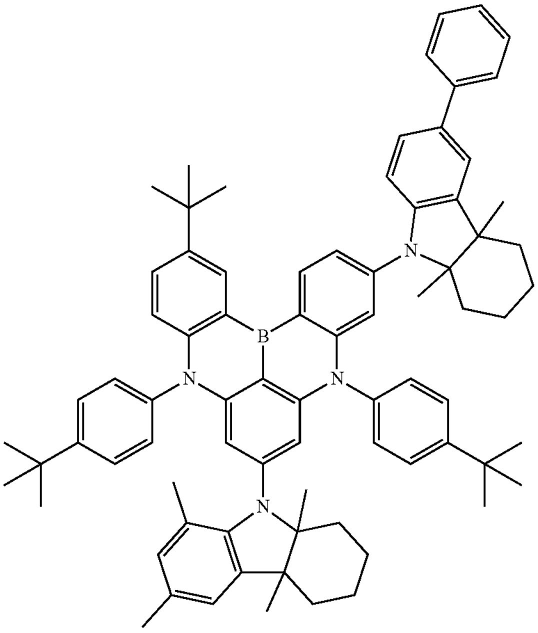

-continued
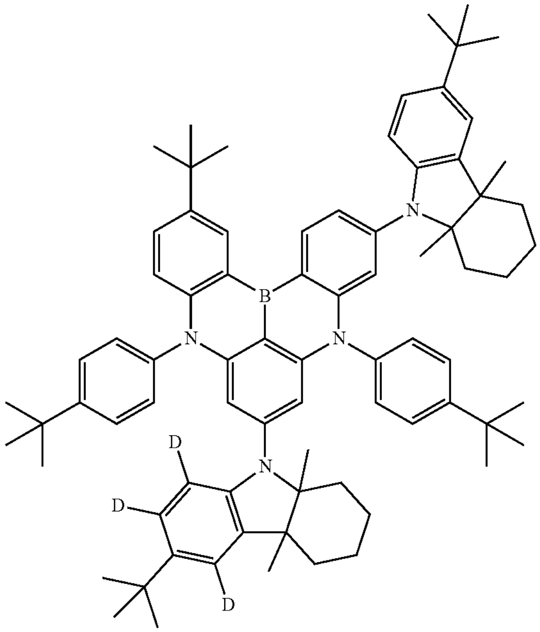
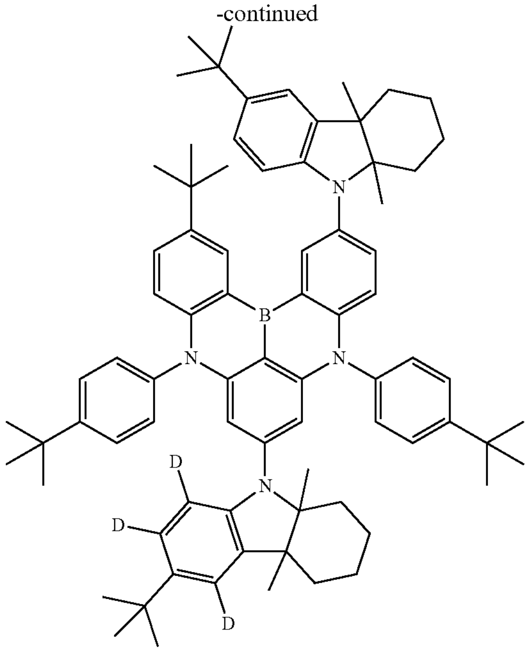
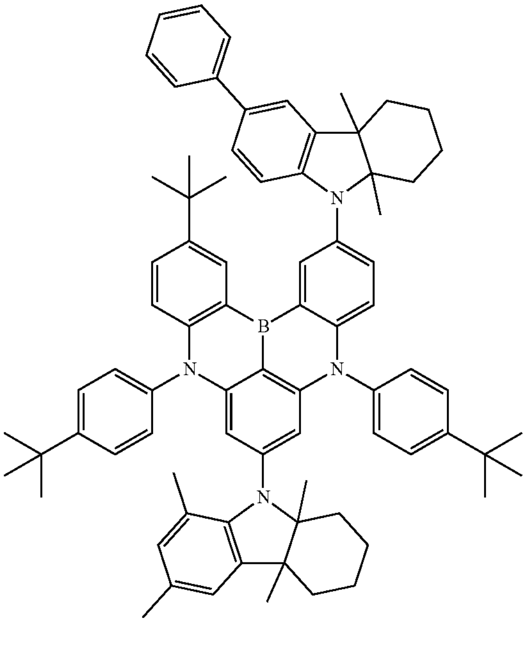
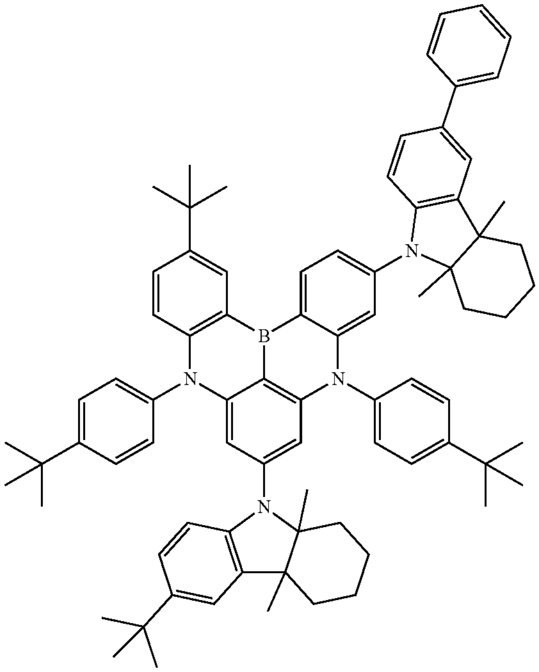

-continued
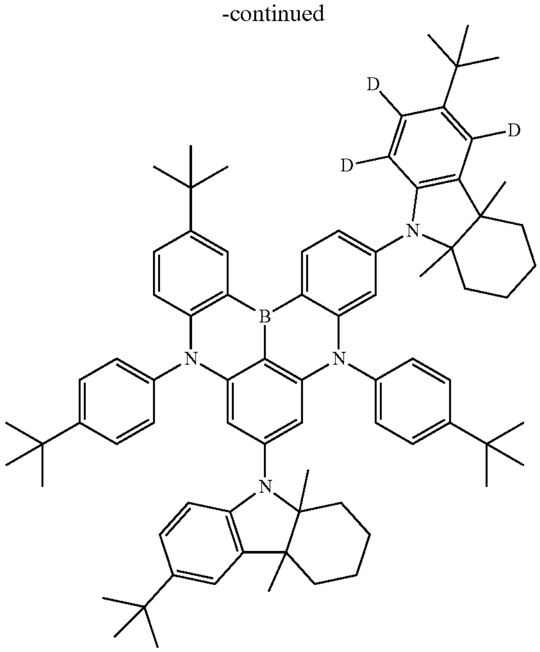
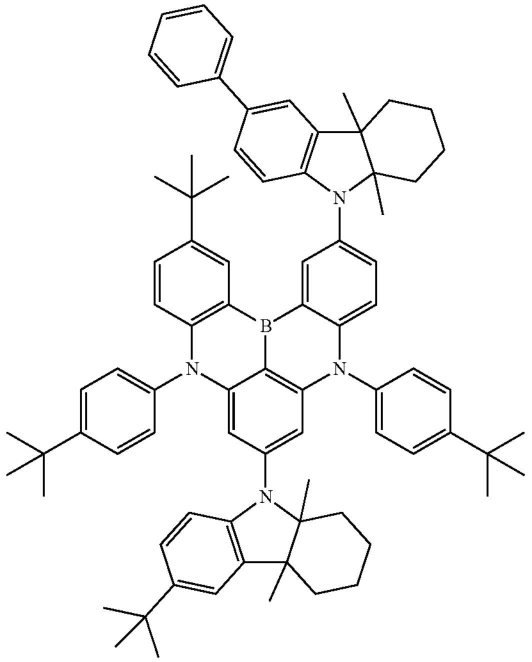
-continued
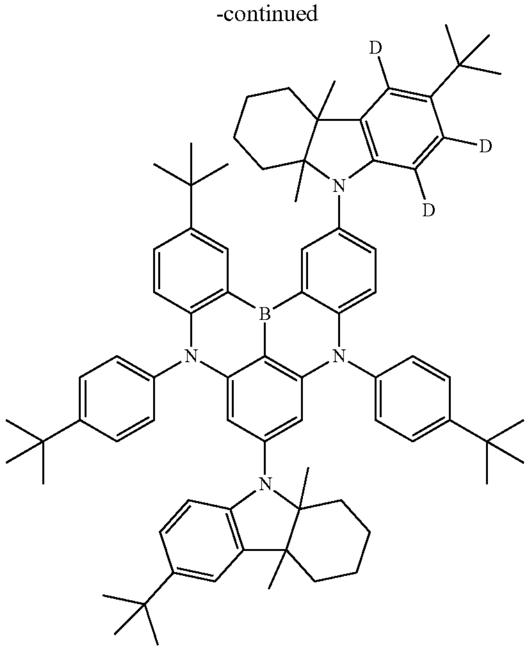
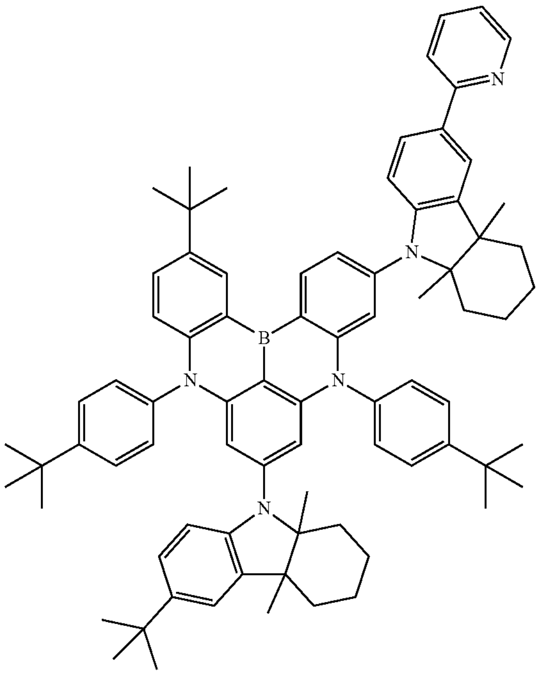

-continued
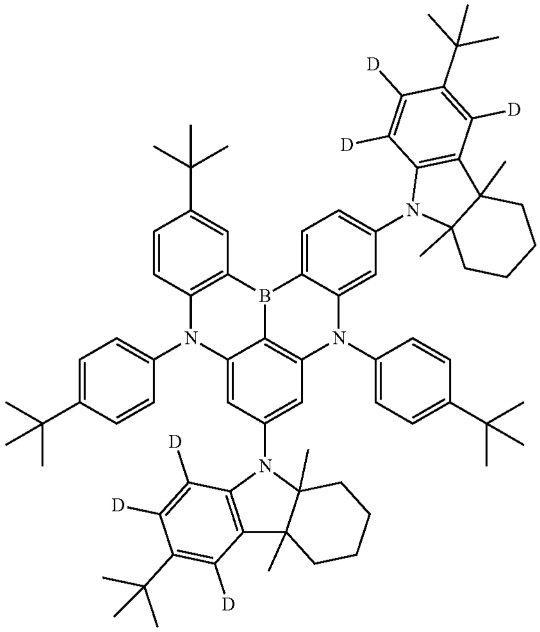
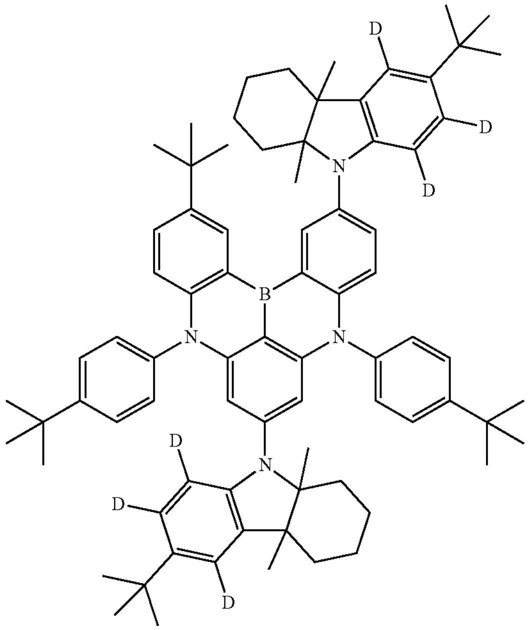
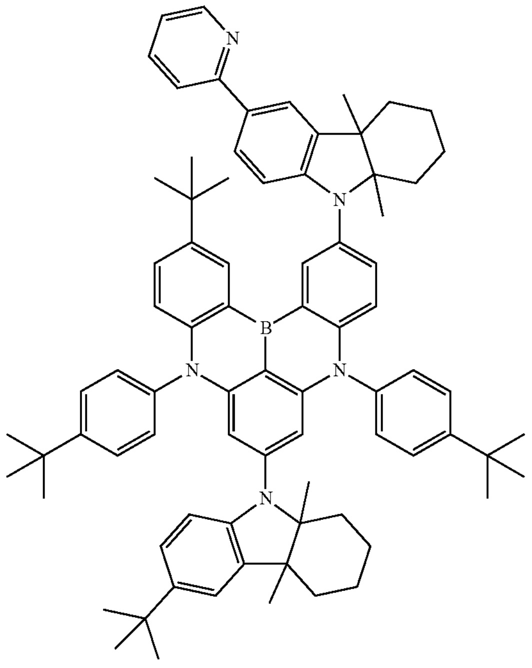
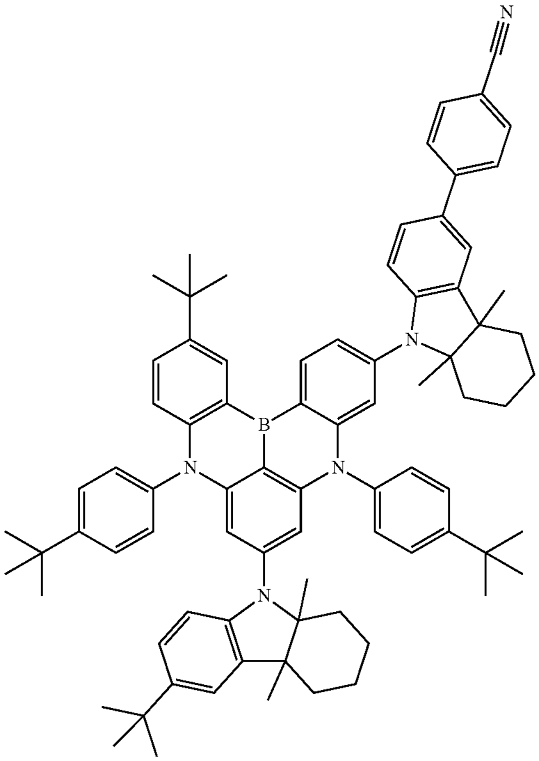

-continued
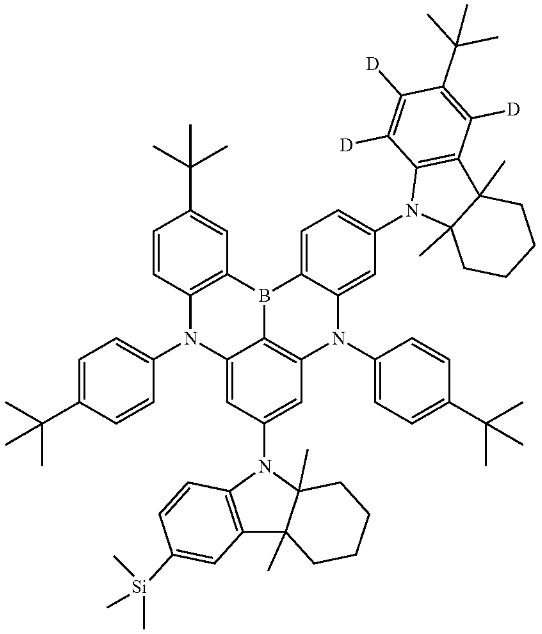
-continued
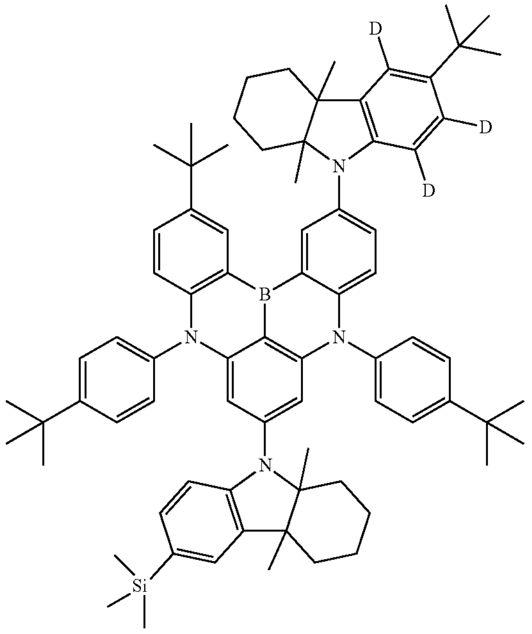
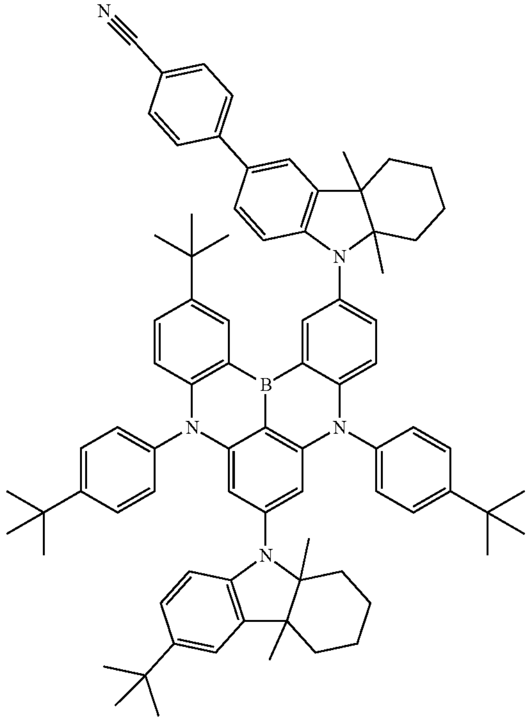
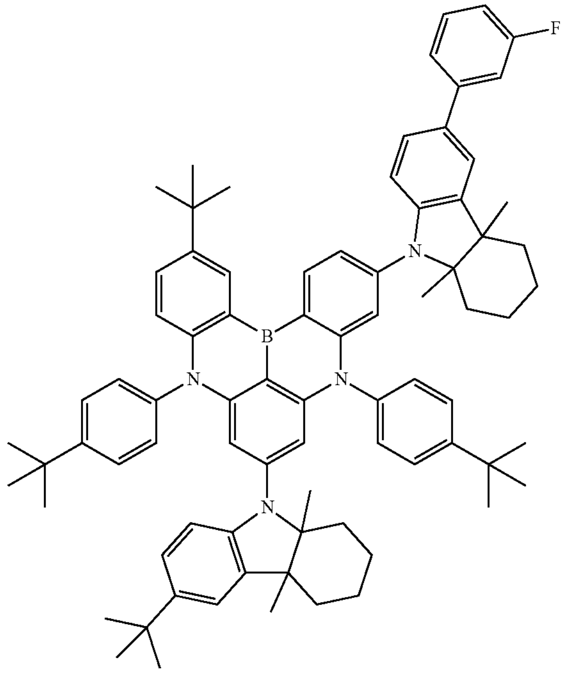

-continued
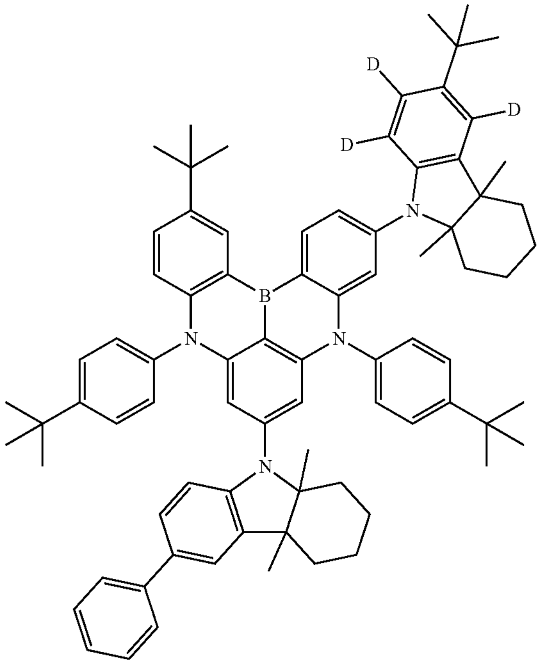
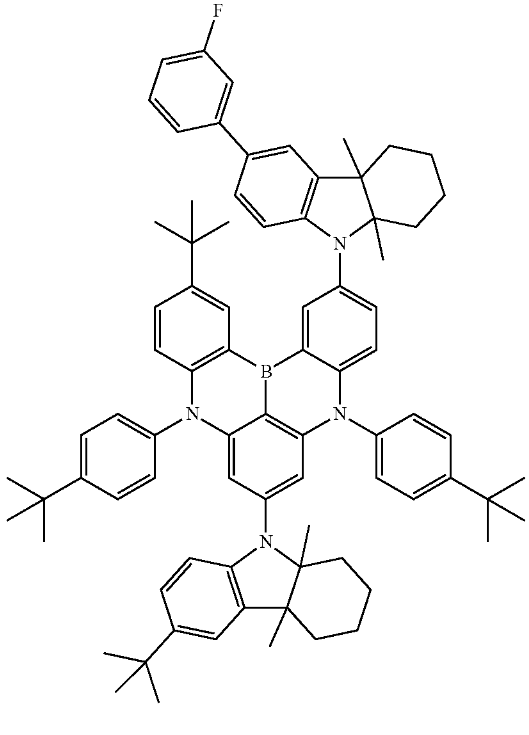
-continued
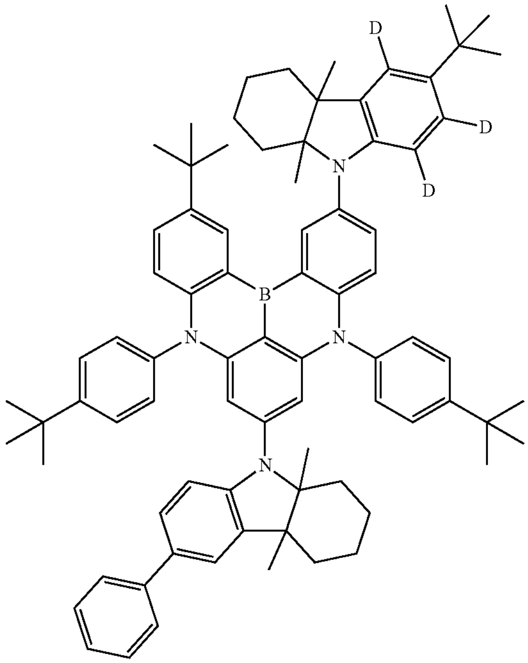
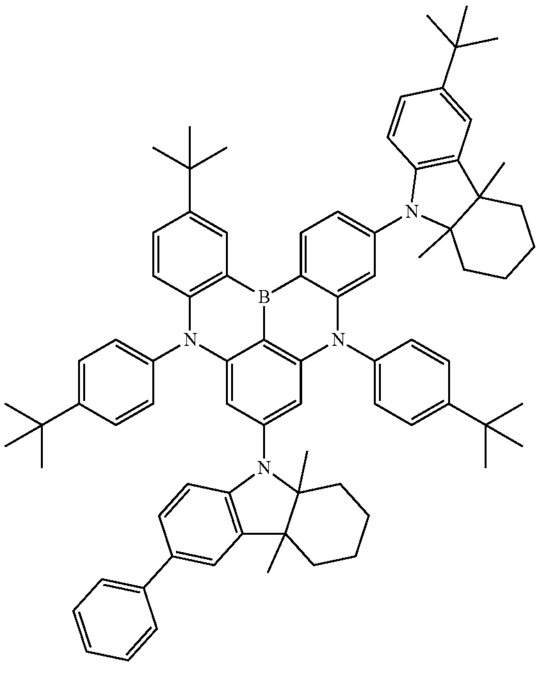

-continued
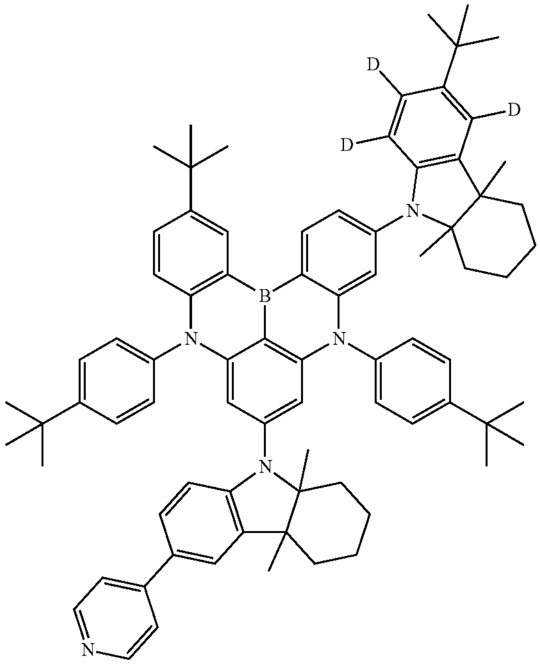
-continued
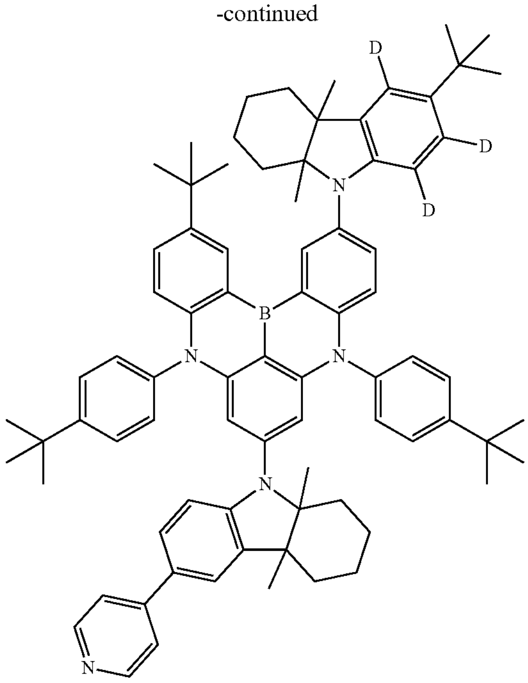
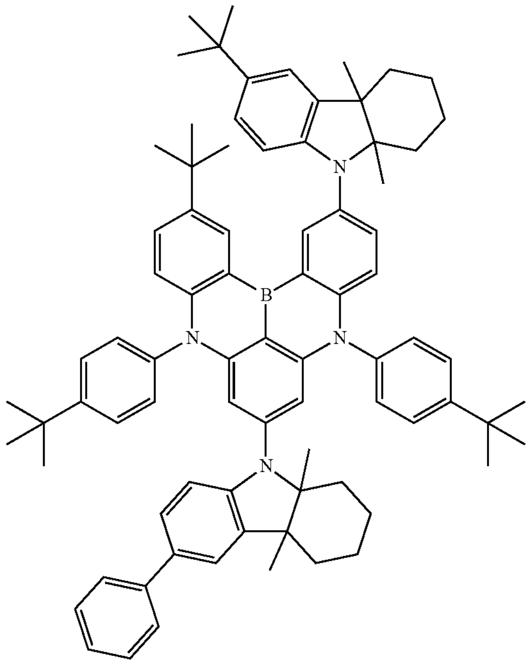
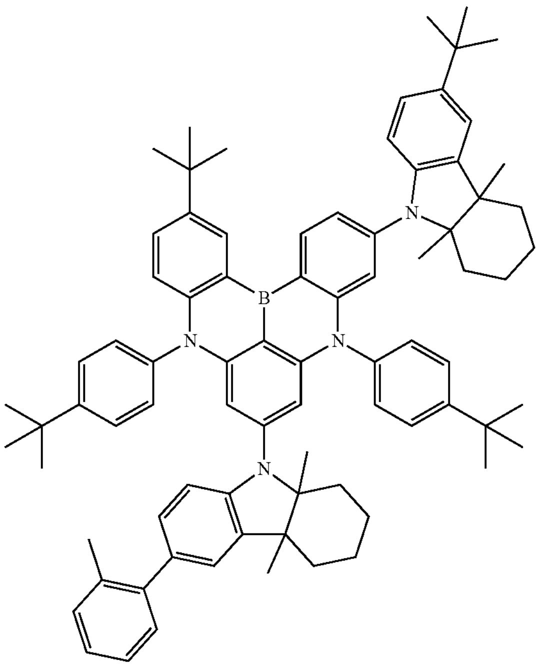

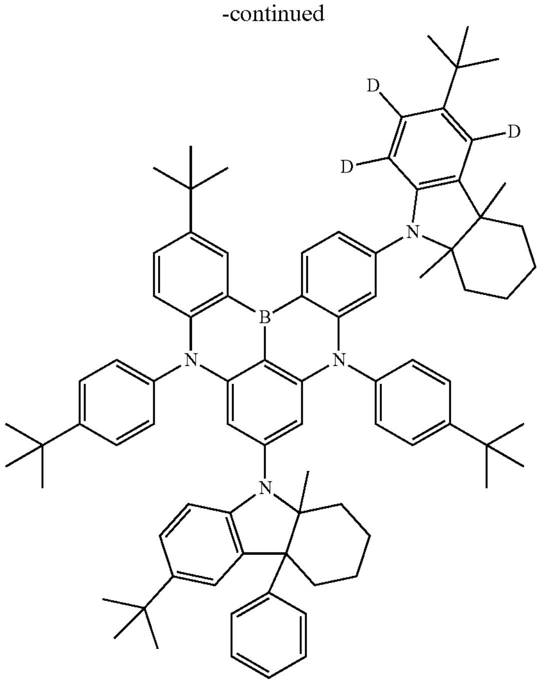
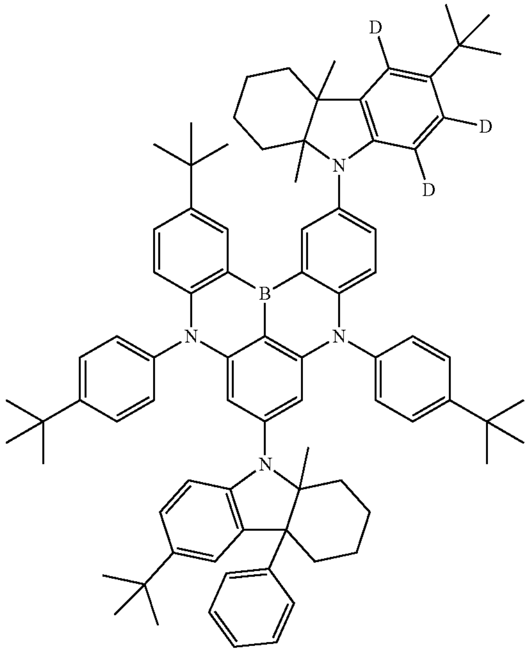
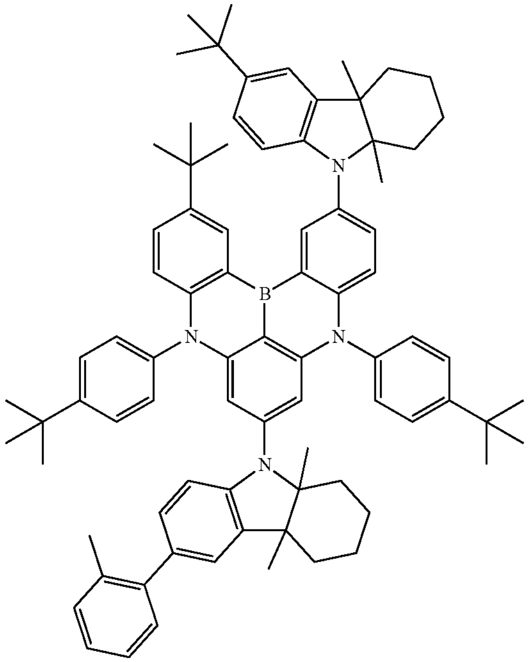
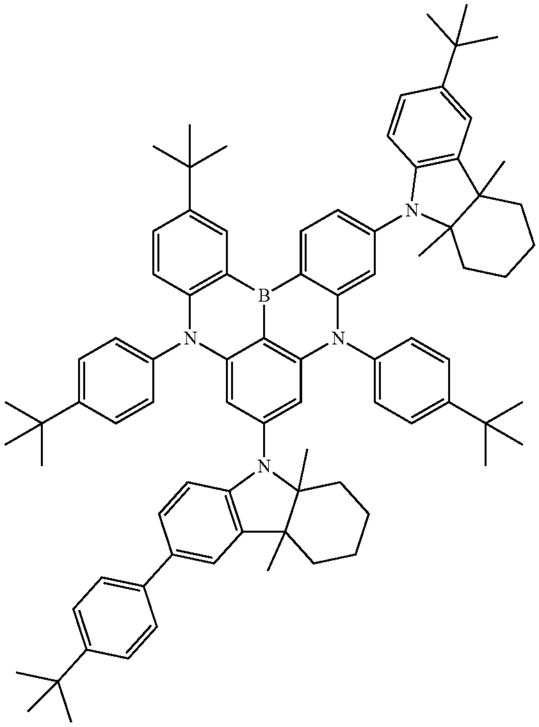

-continued
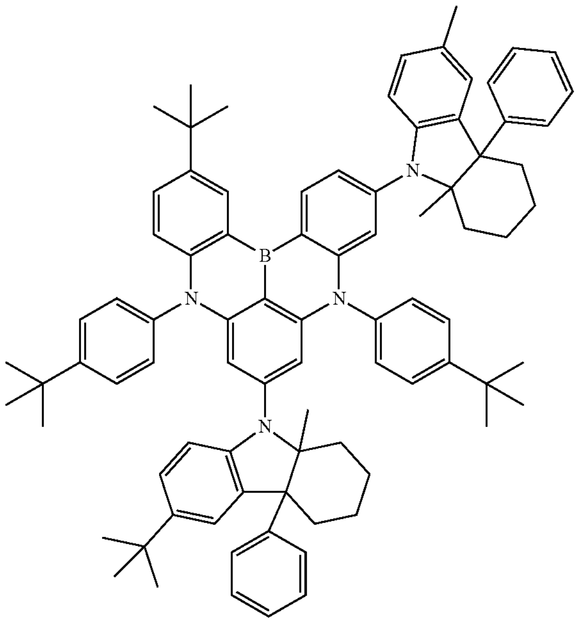
-continued
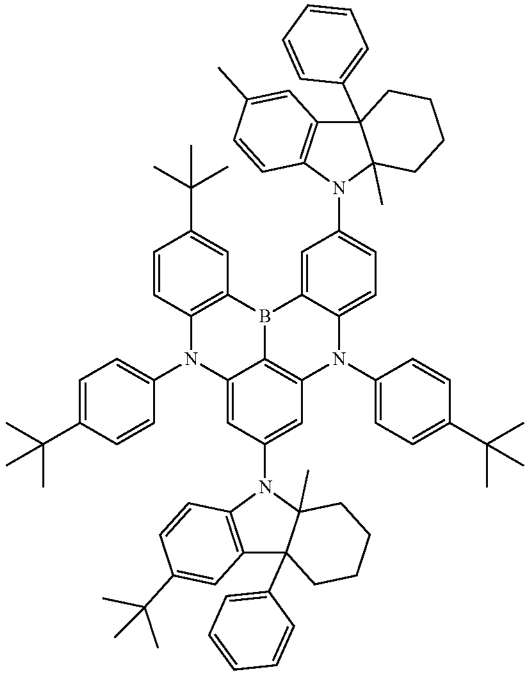
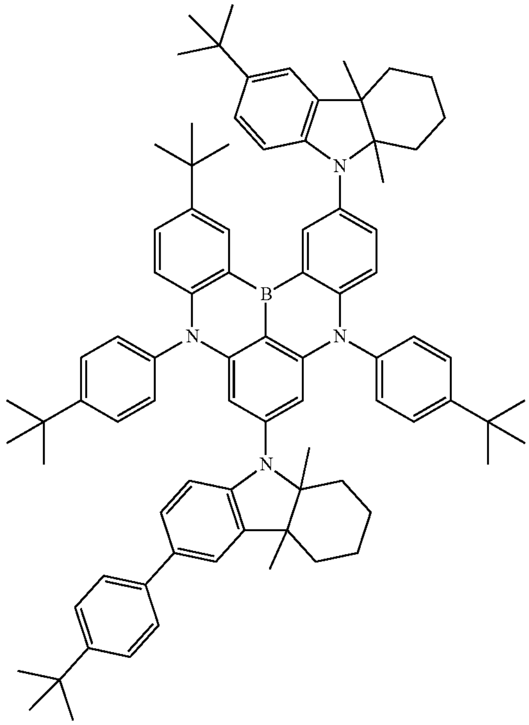
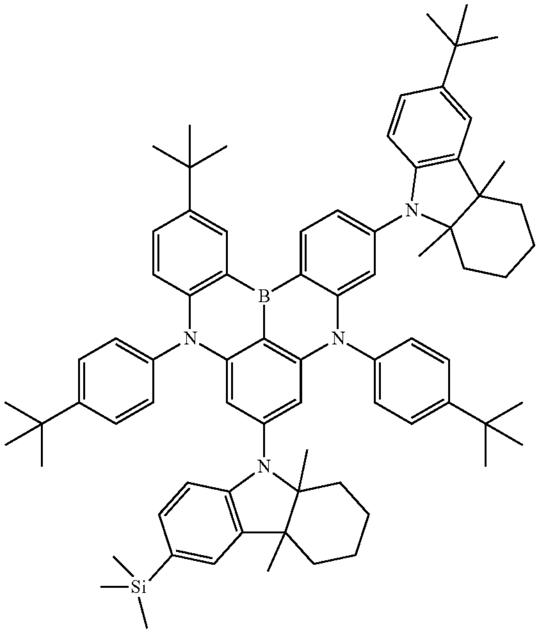

-continued
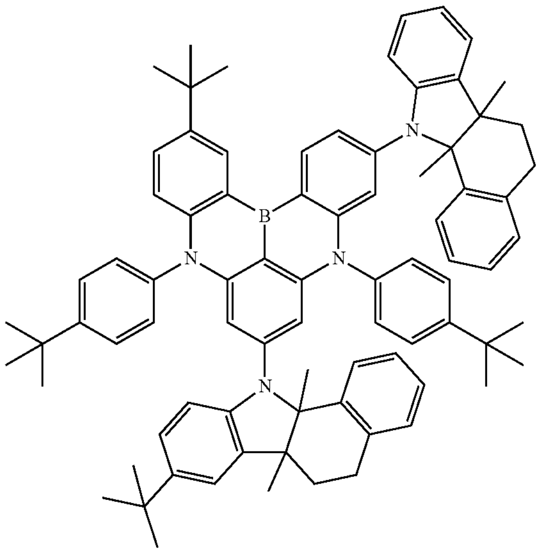
-continued
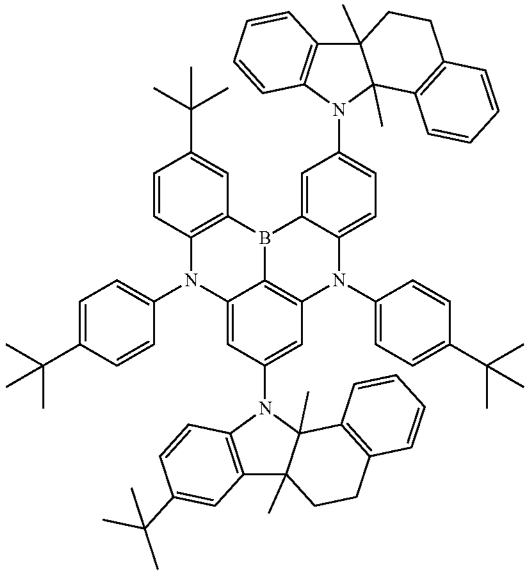
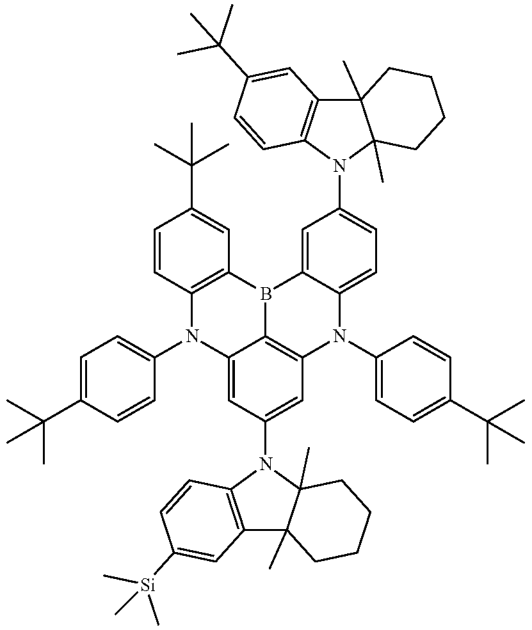
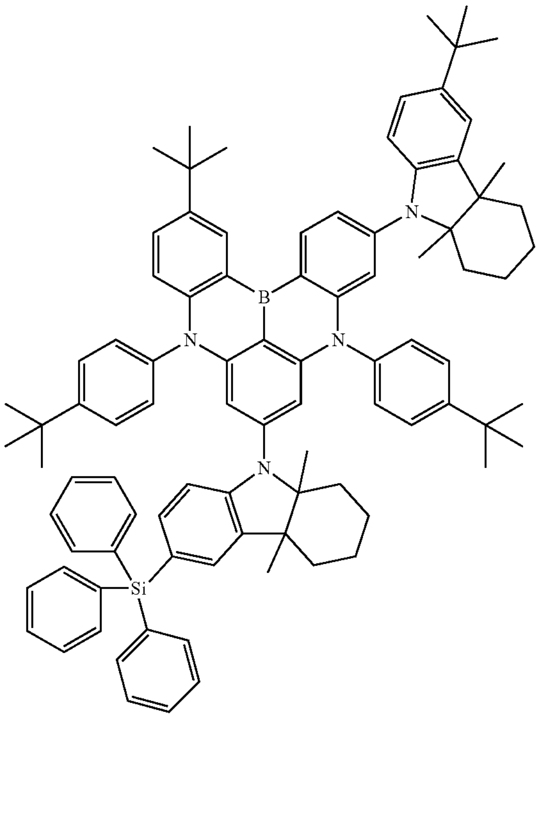

-continued
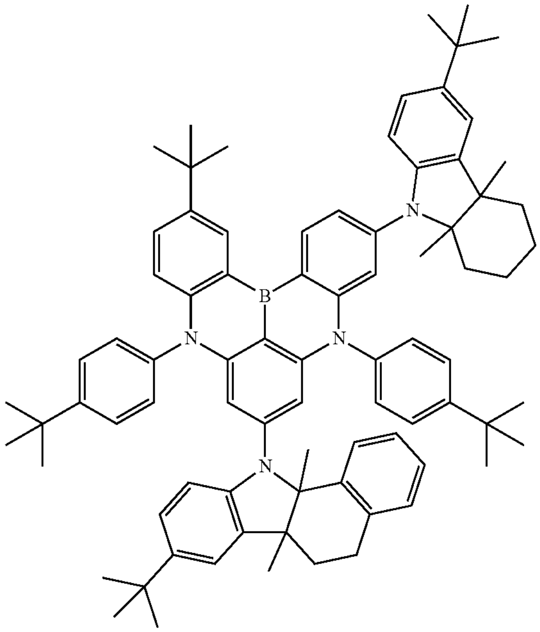
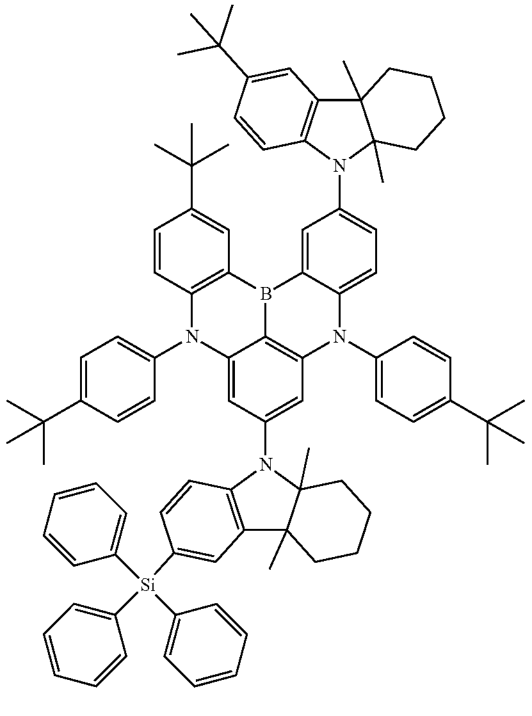
-continued
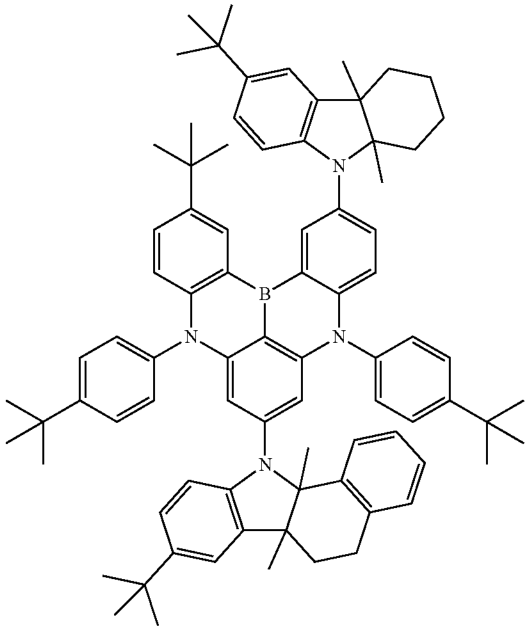
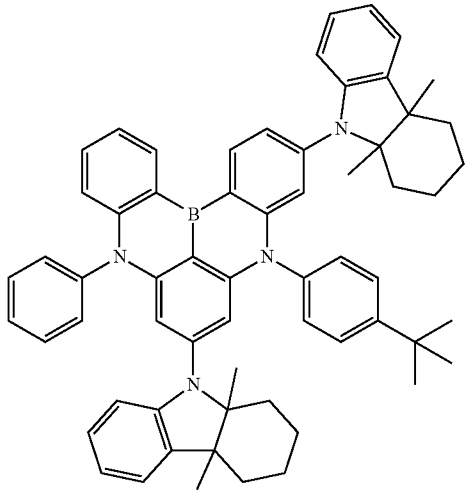
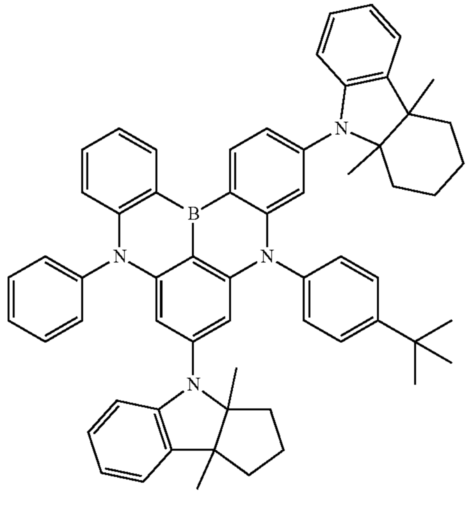

-continued
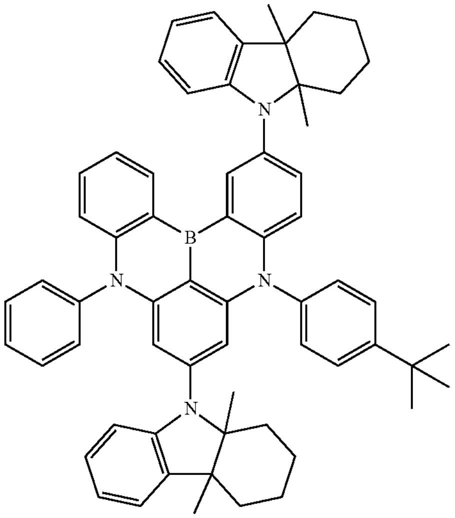
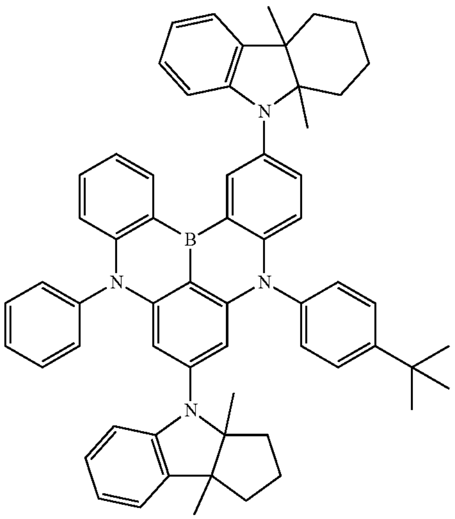
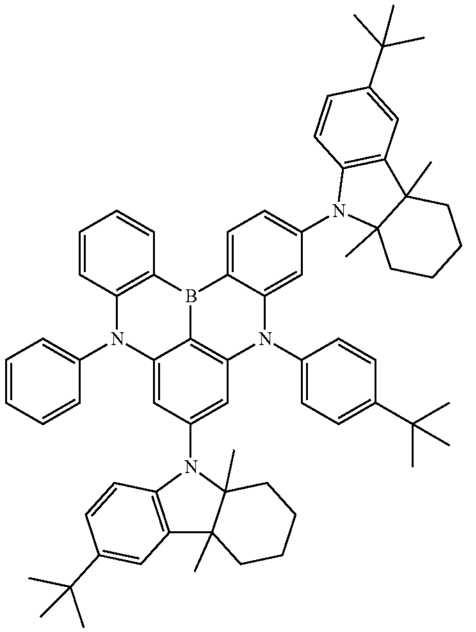
-continued
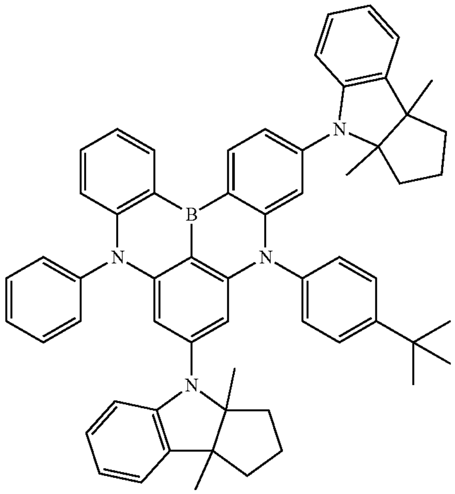
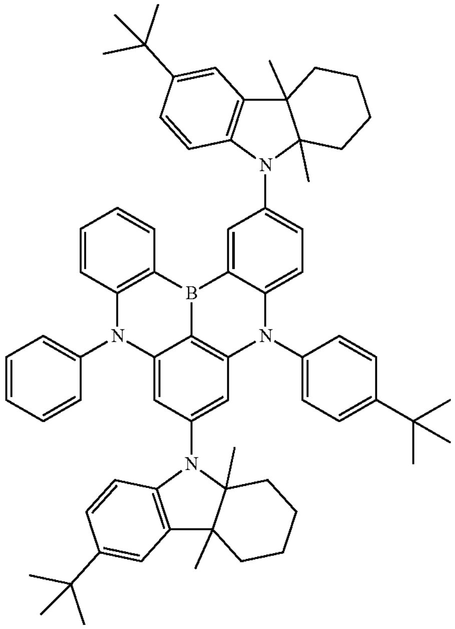
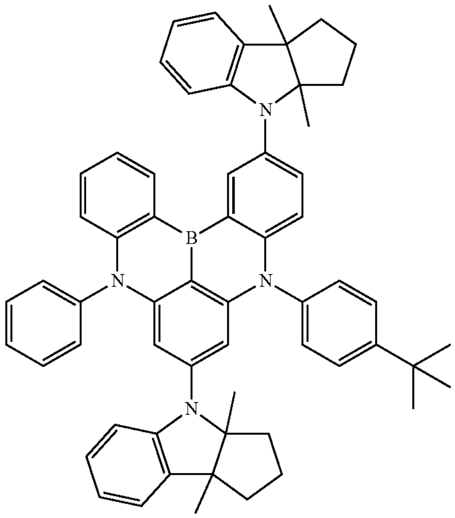

-continued
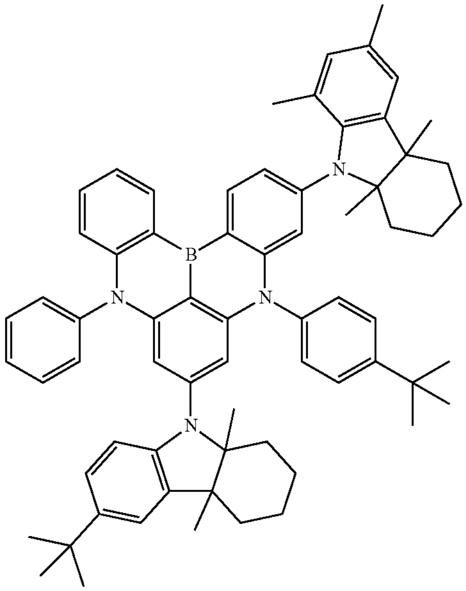
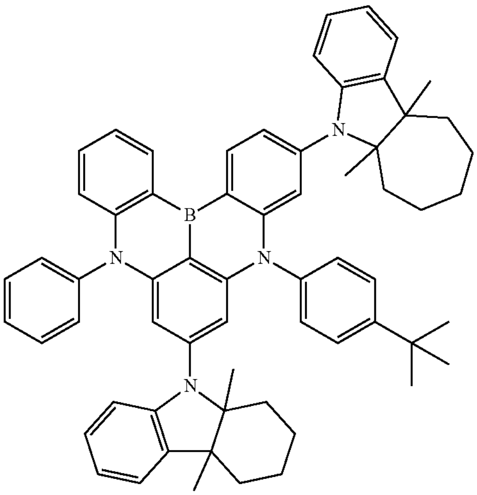
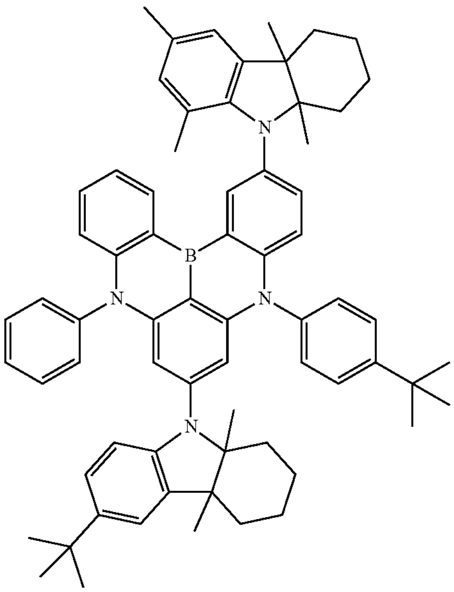
-continued
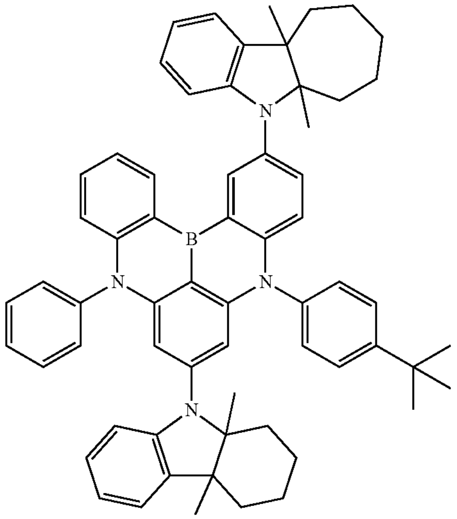
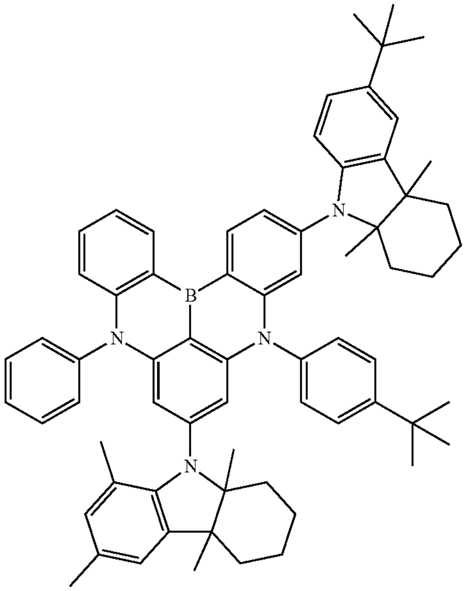
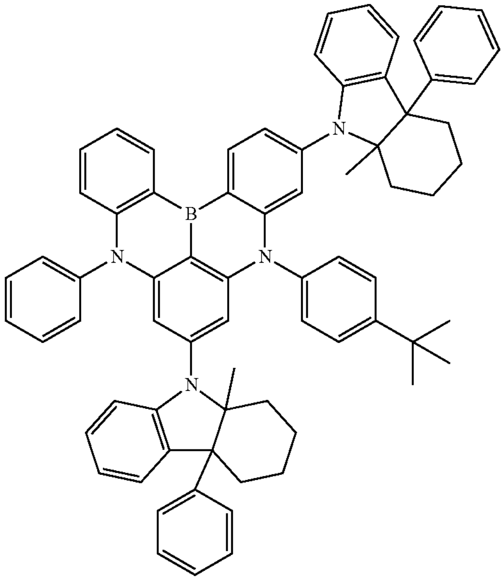

-continued
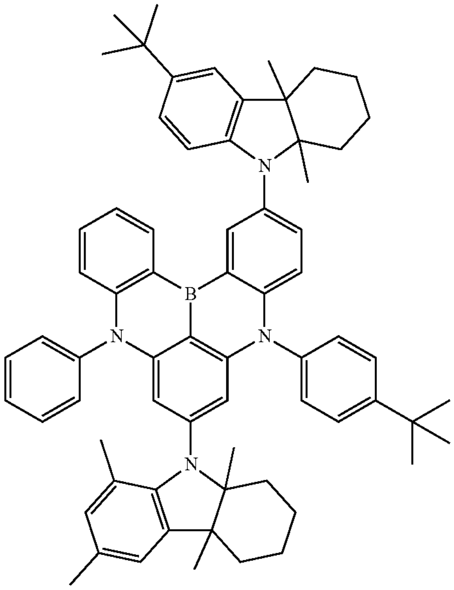
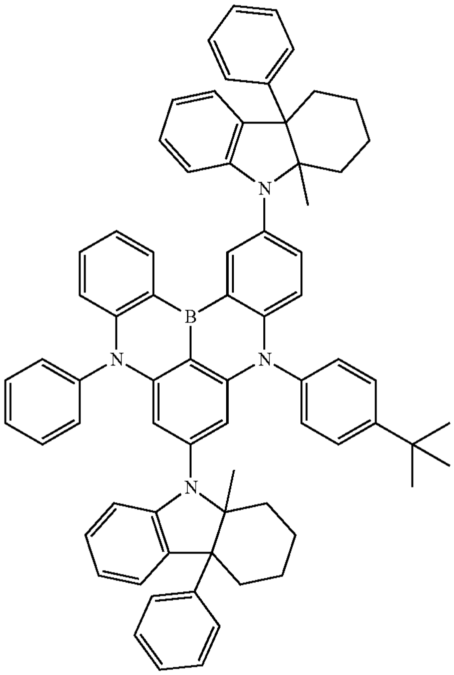
-continued
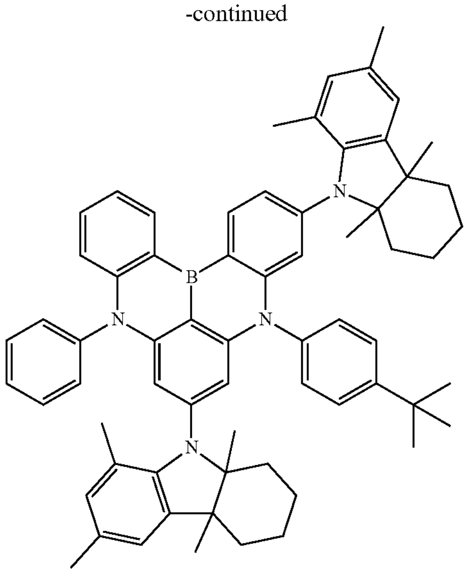
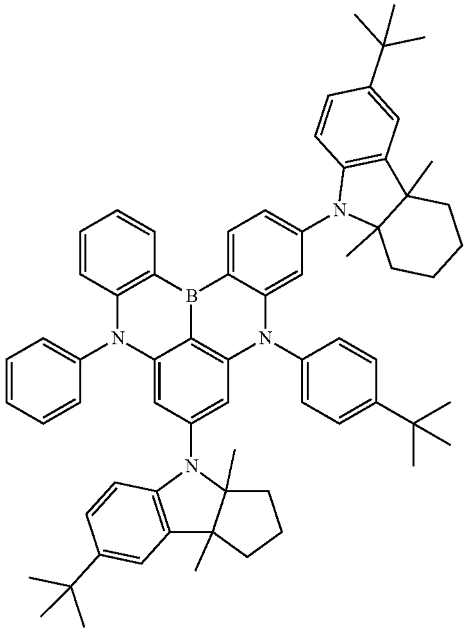
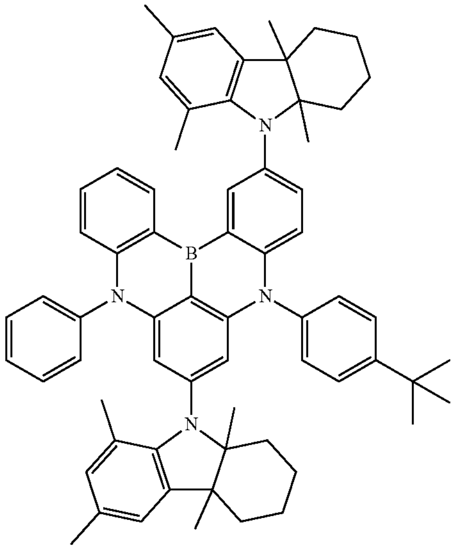

-continued
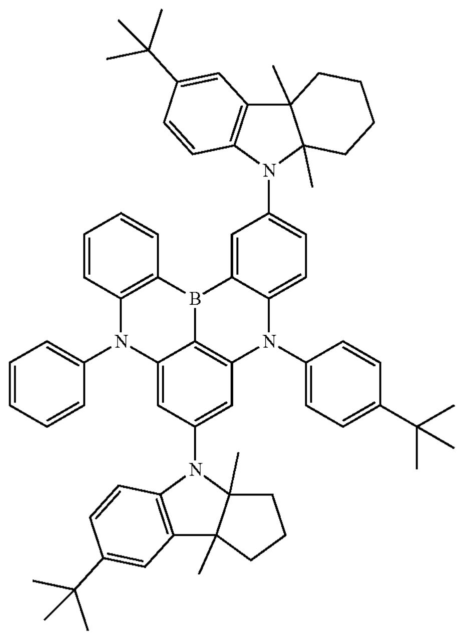
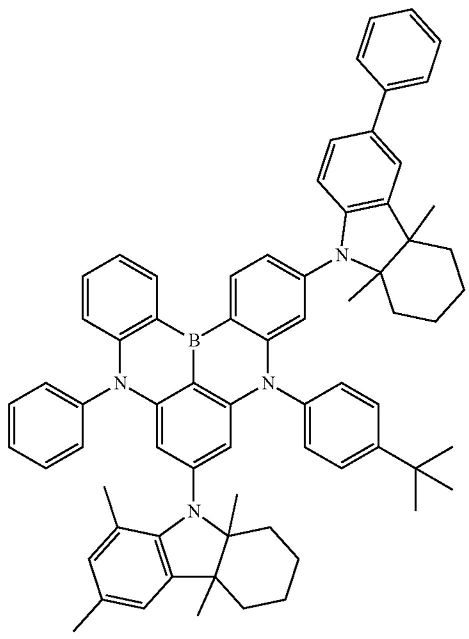
-continued
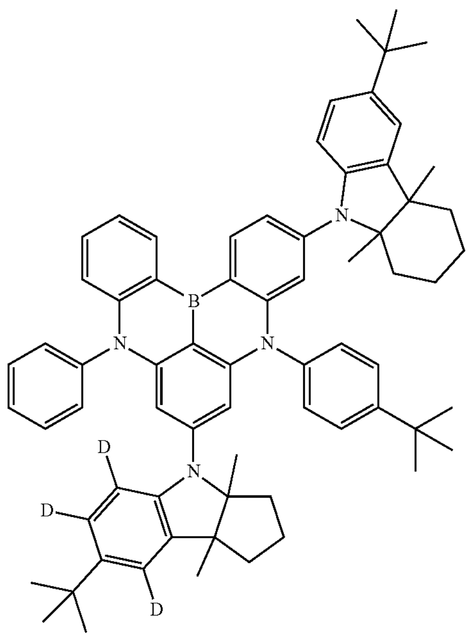
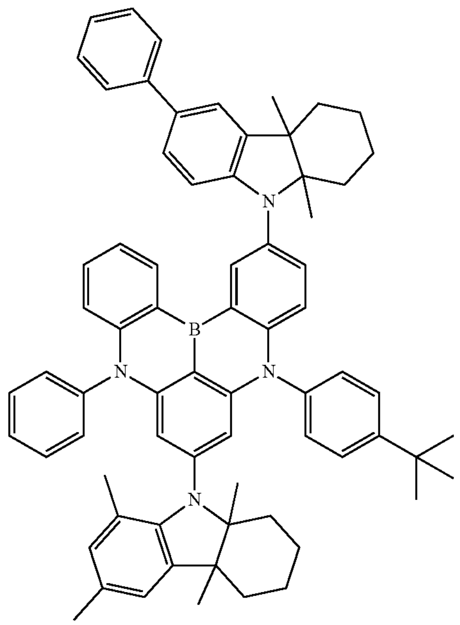

-continued
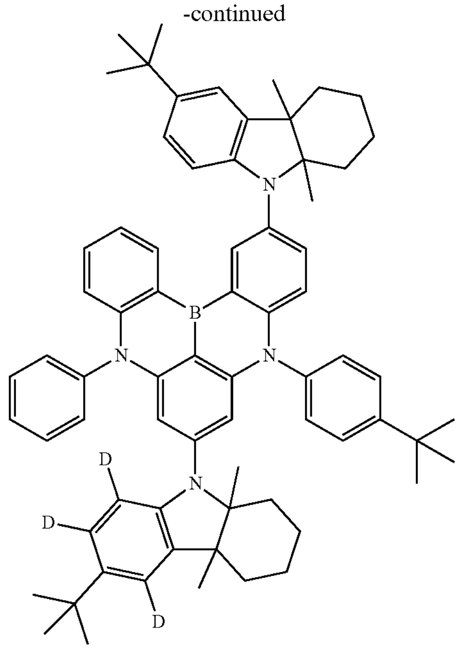
-continued
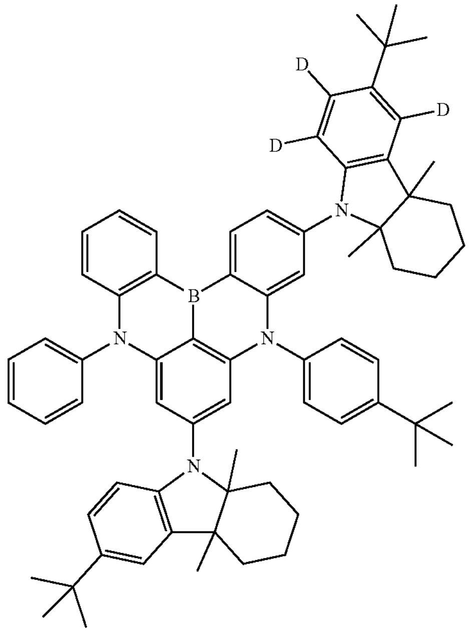
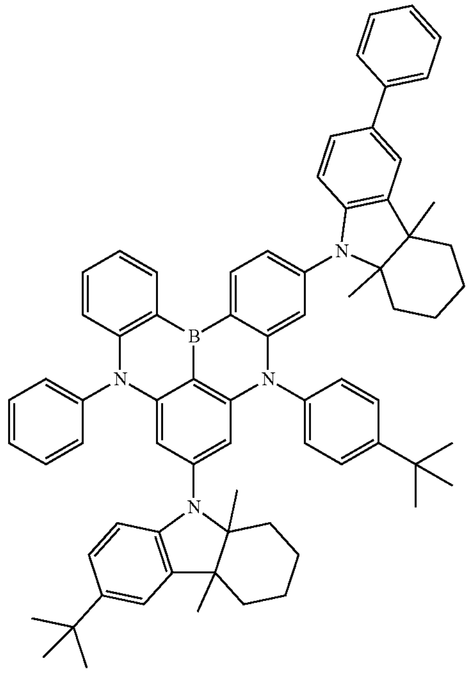
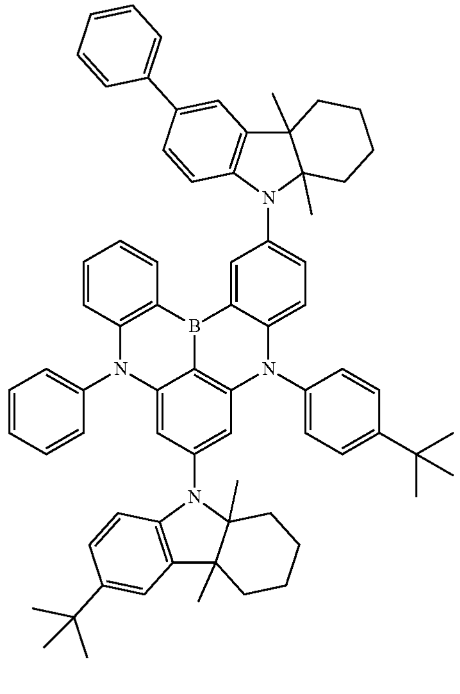

-continued
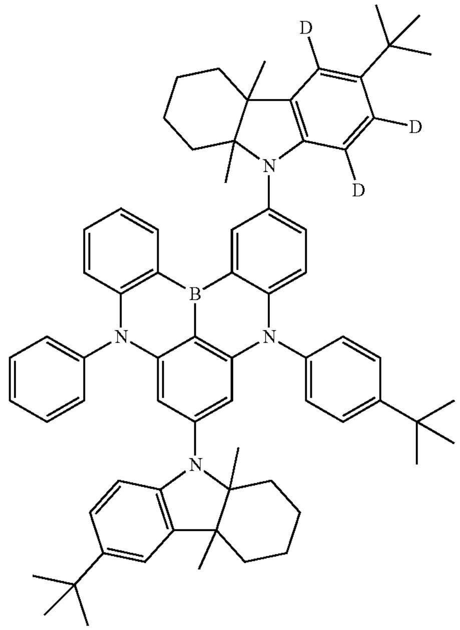
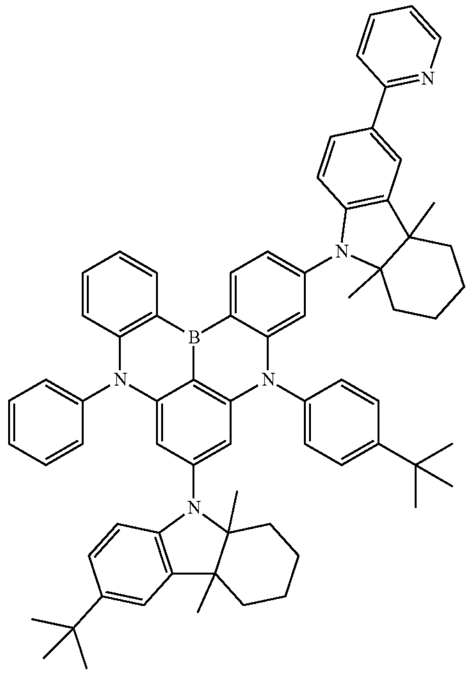
-continued
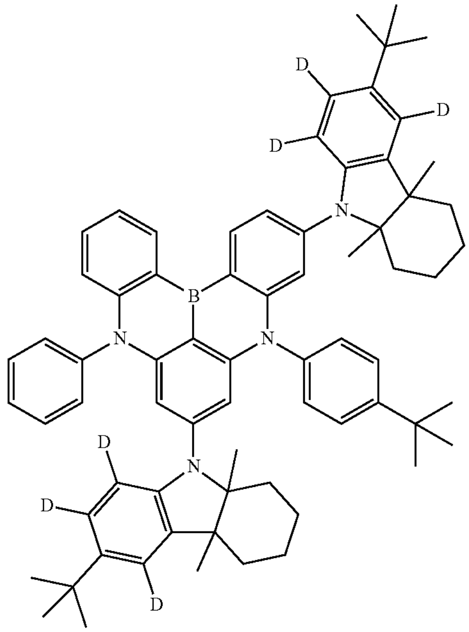
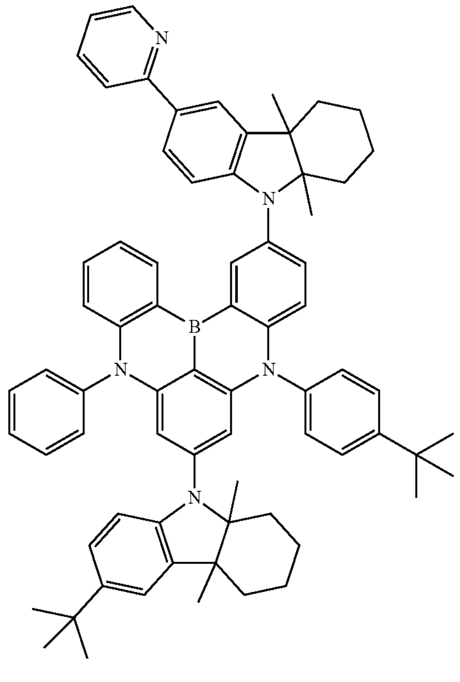

-continued
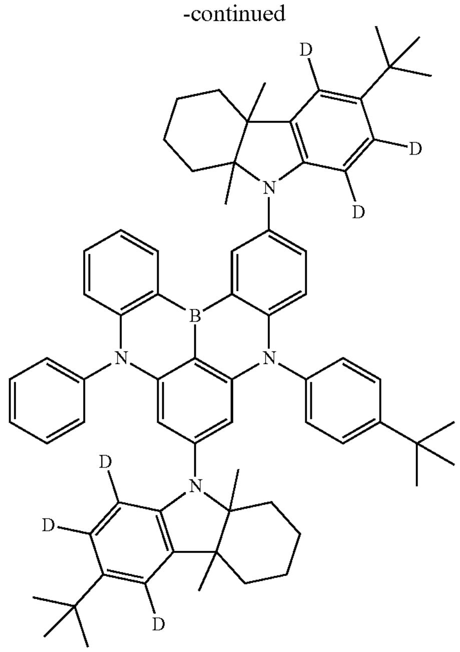
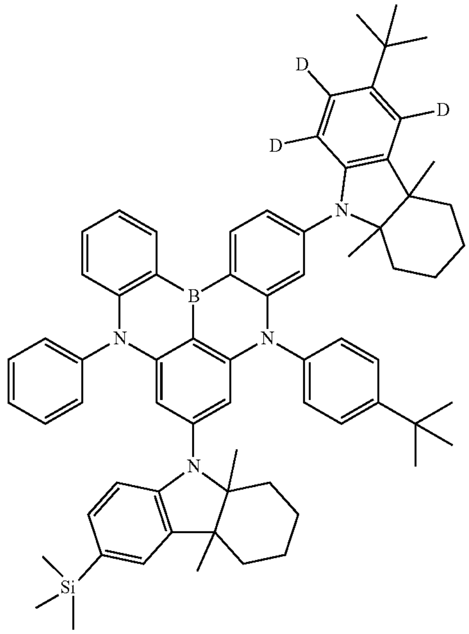
-continued
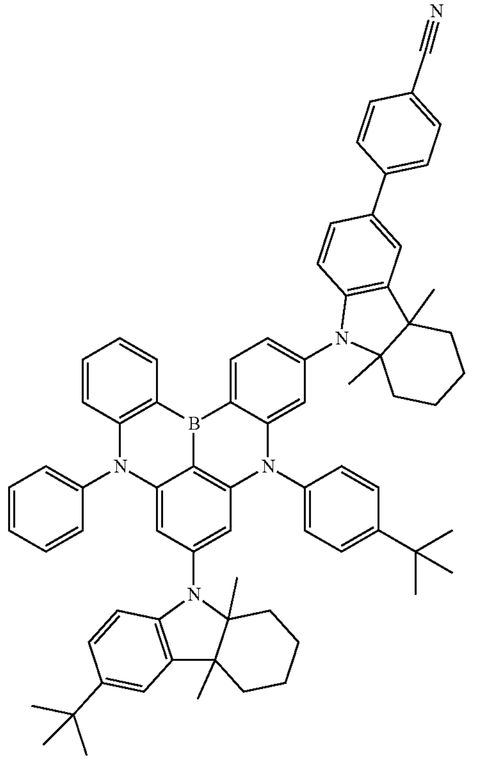
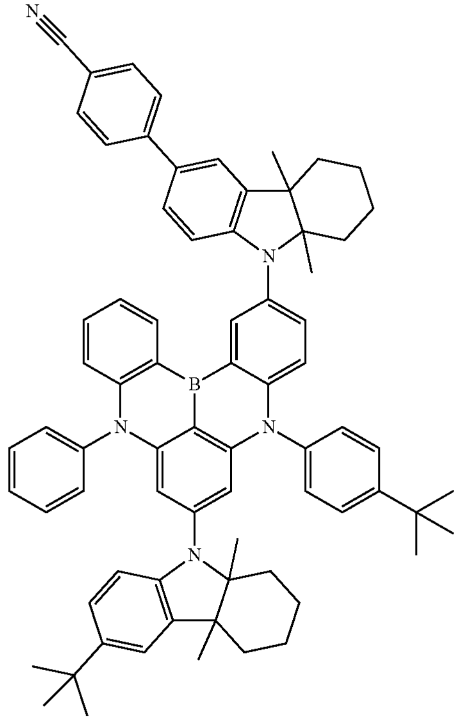

-continued
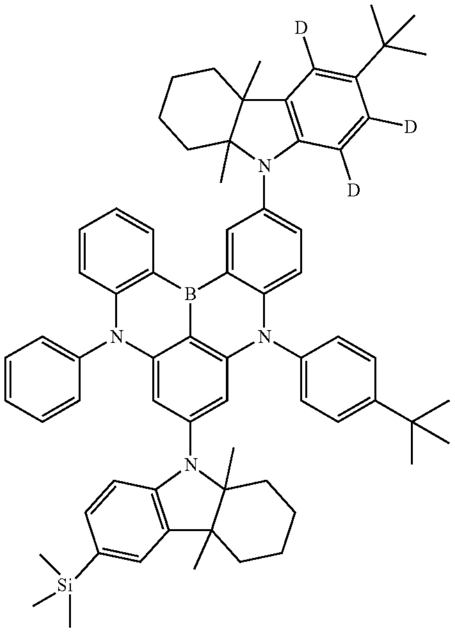
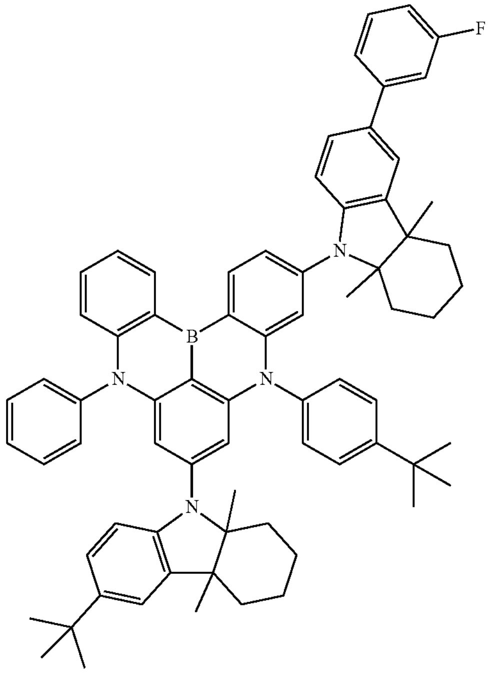
-continued
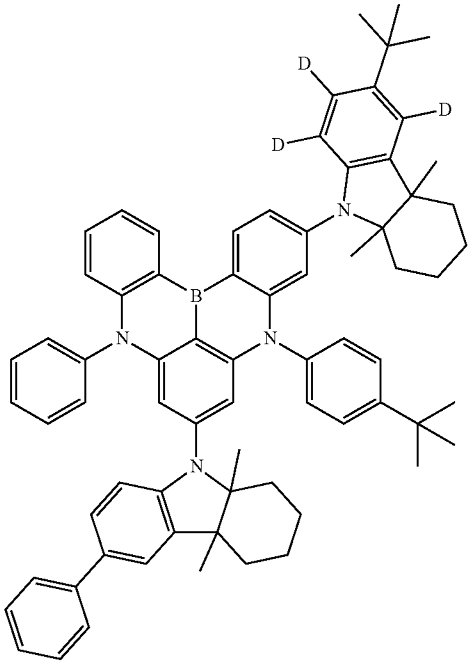
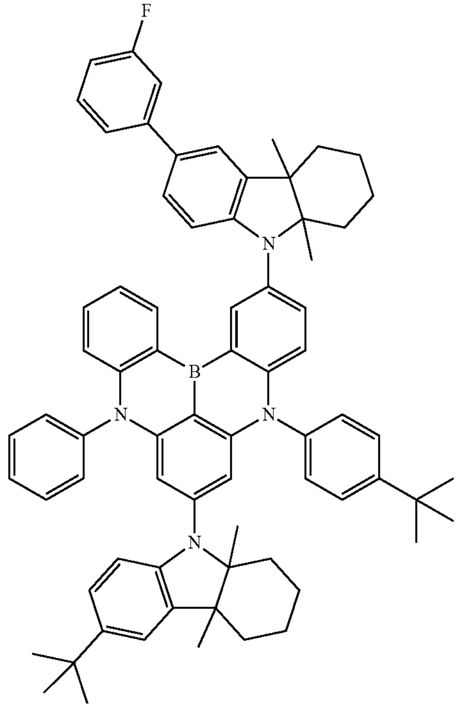

-continued
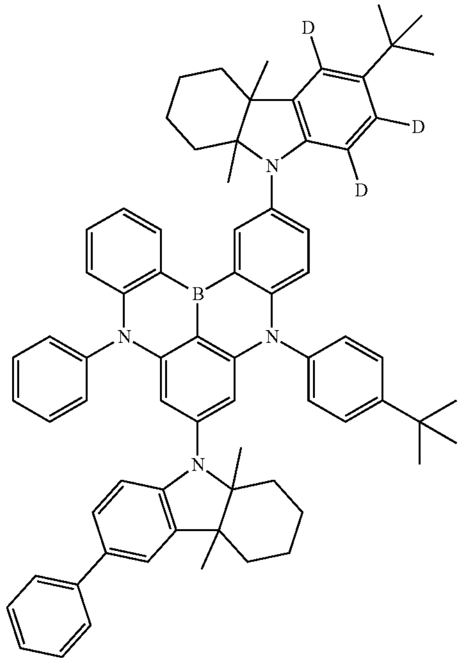
-continued
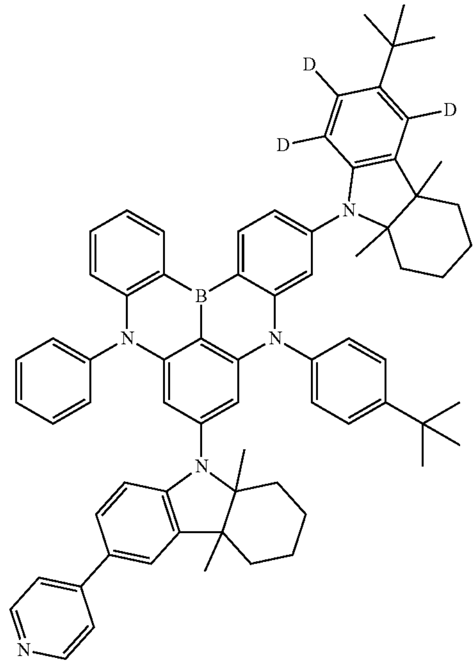
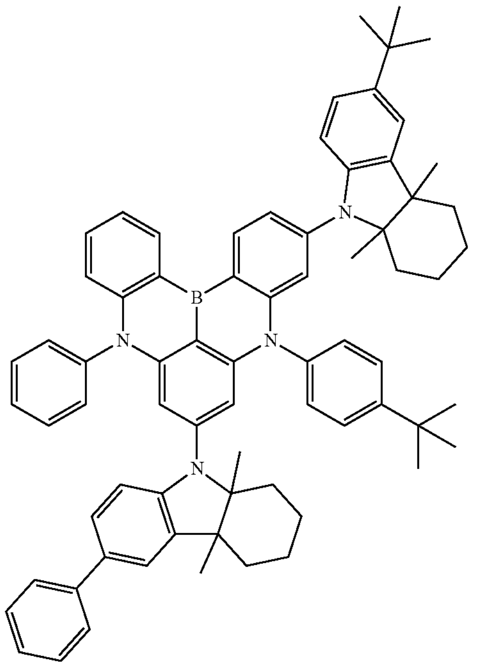
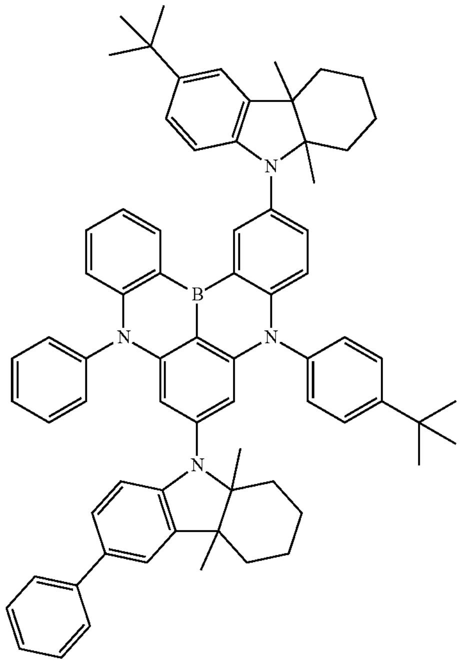

-continued
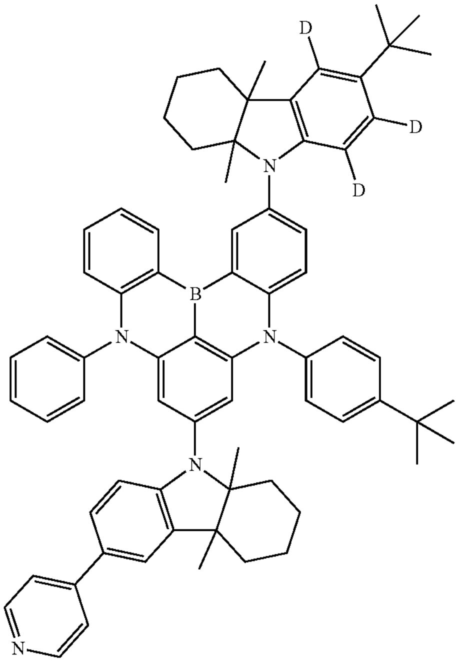
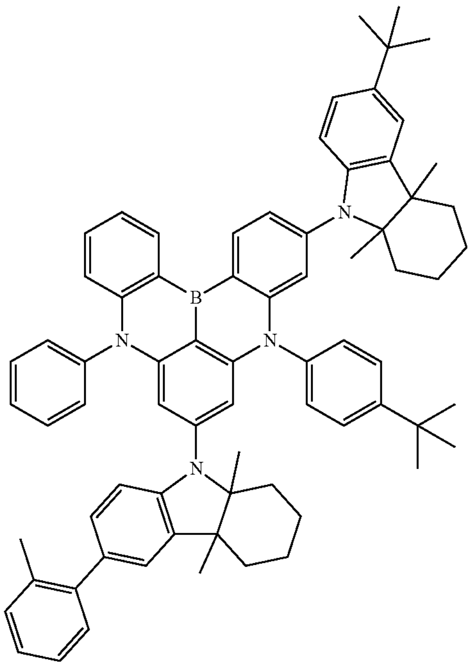
-continued
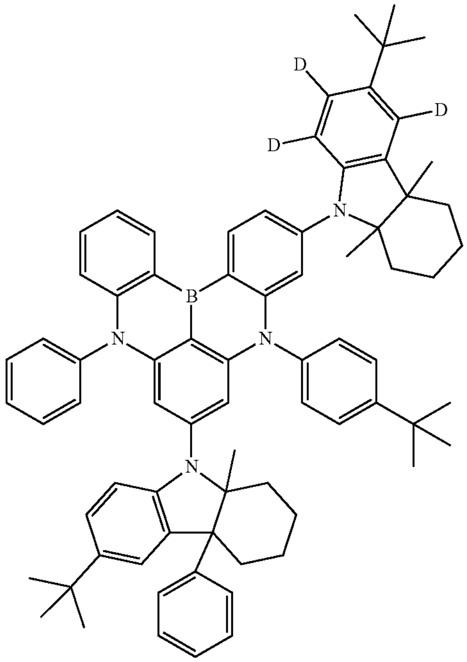
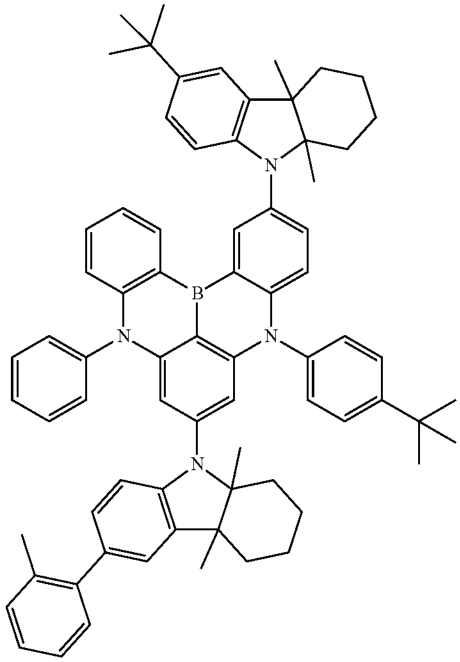

-continued
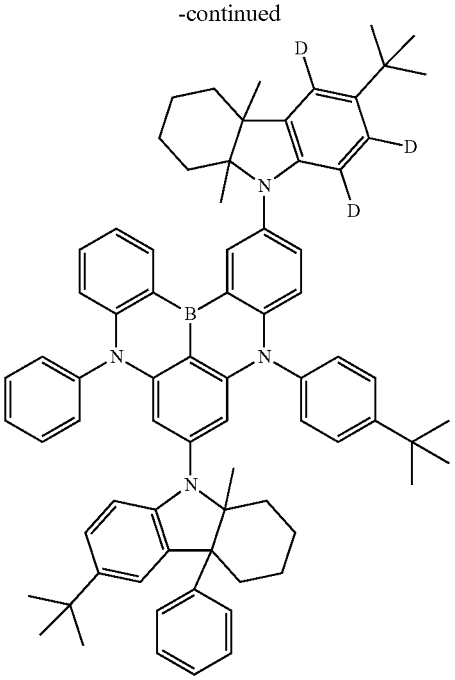
-continued
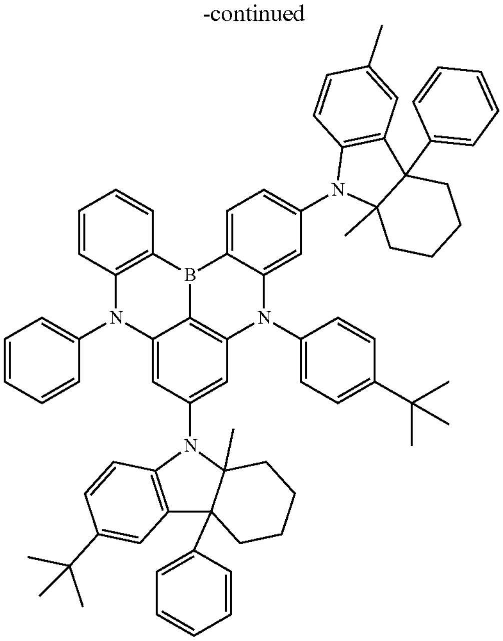
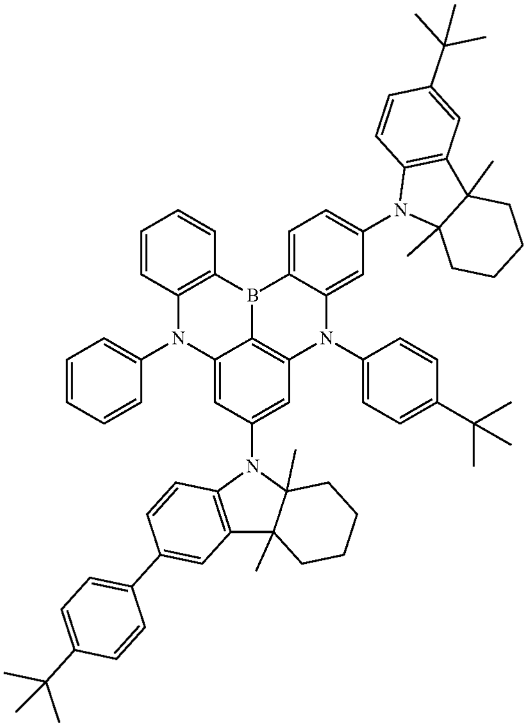
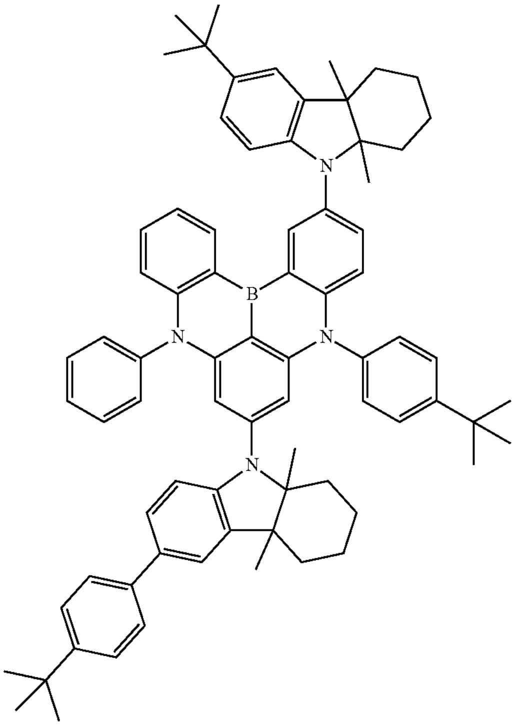

-continued
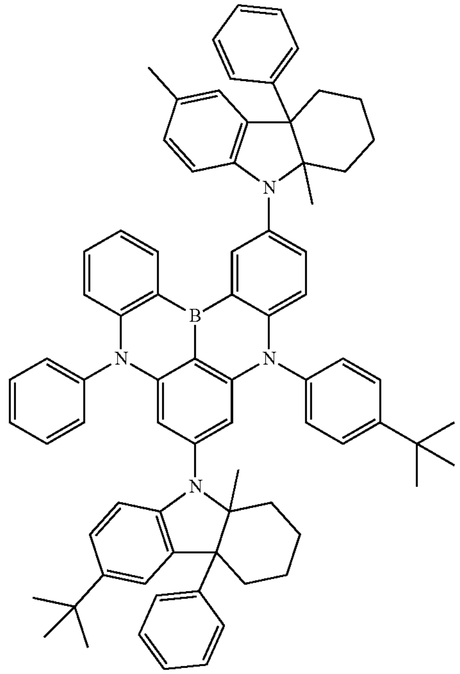
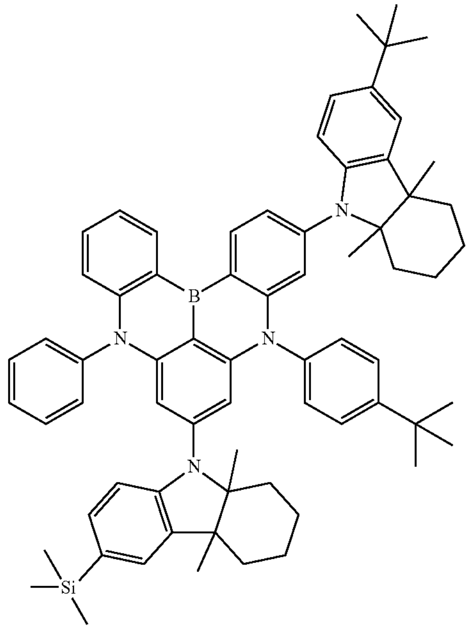
-continued
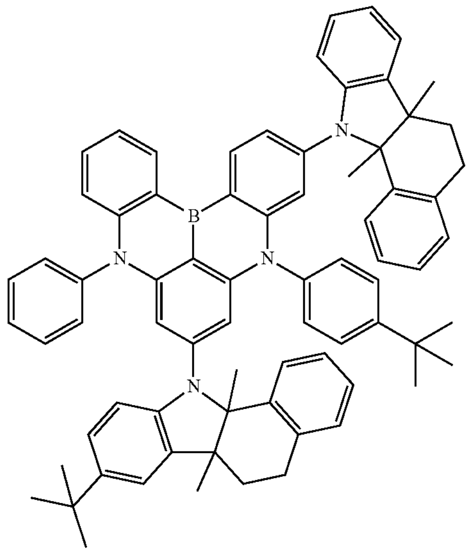
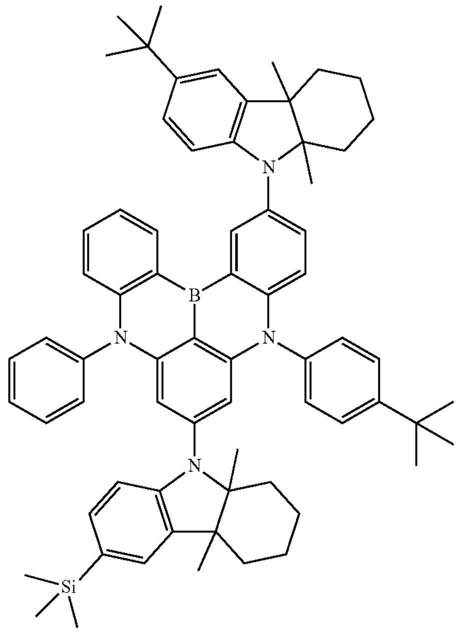

-continued
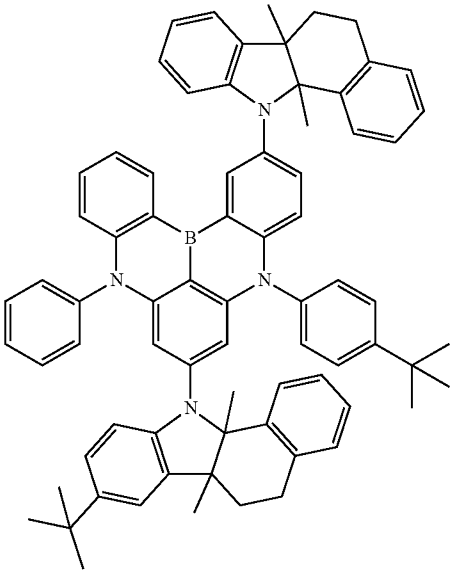
-continued
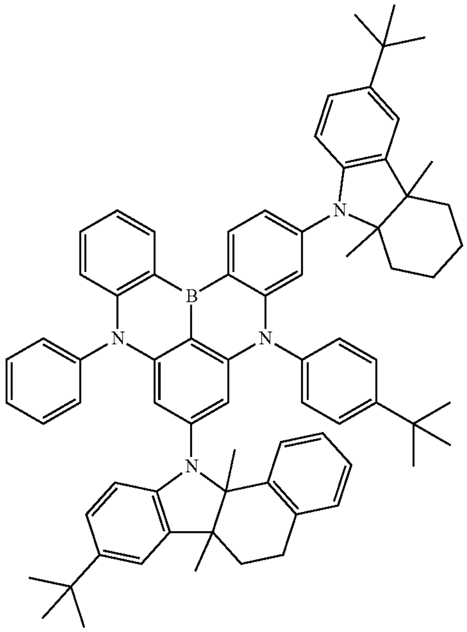
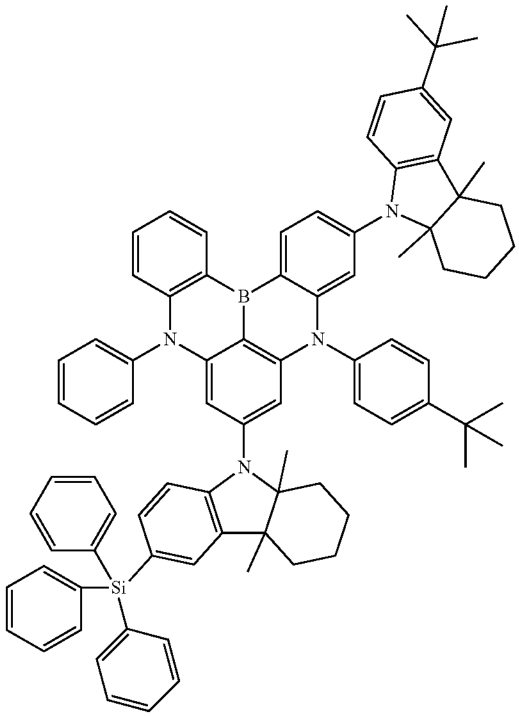
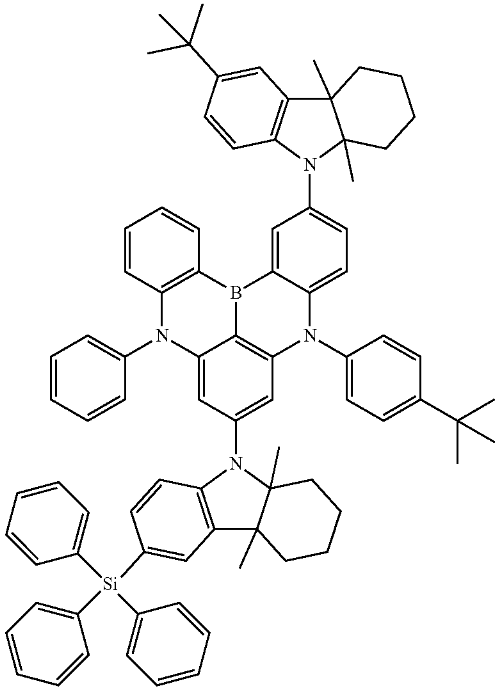

-continued
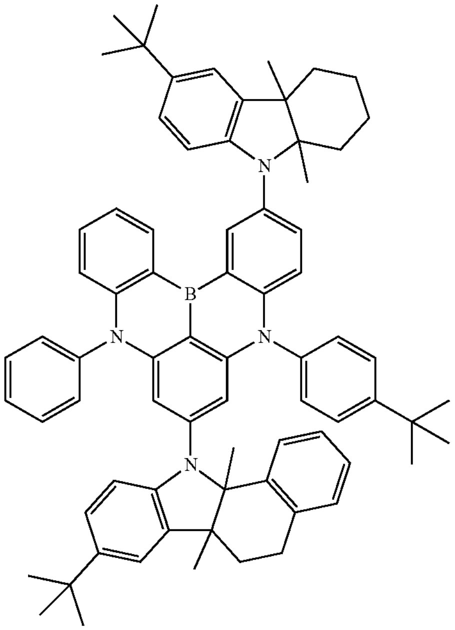
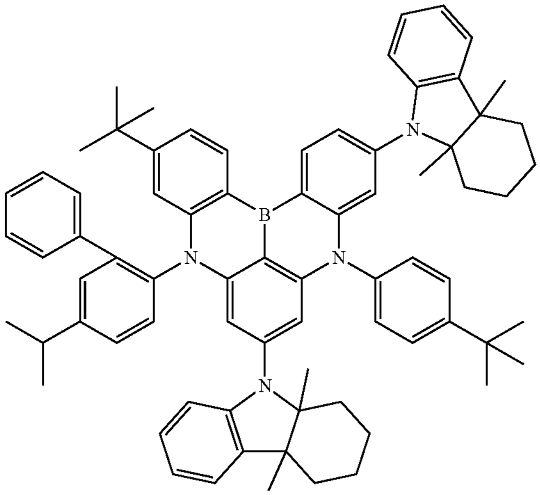
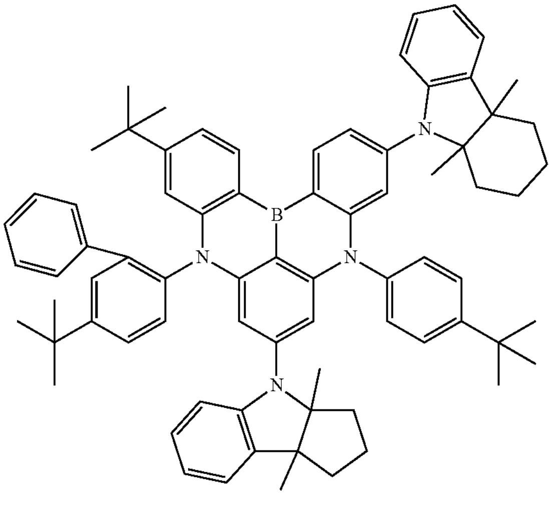
-continued
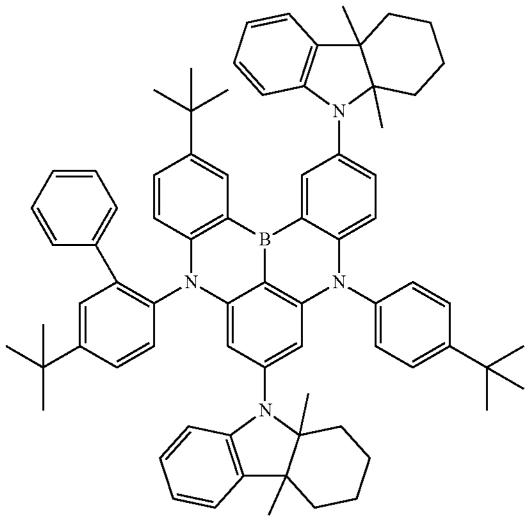
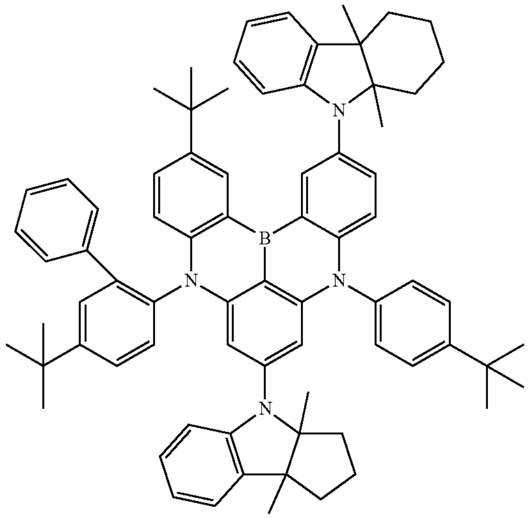
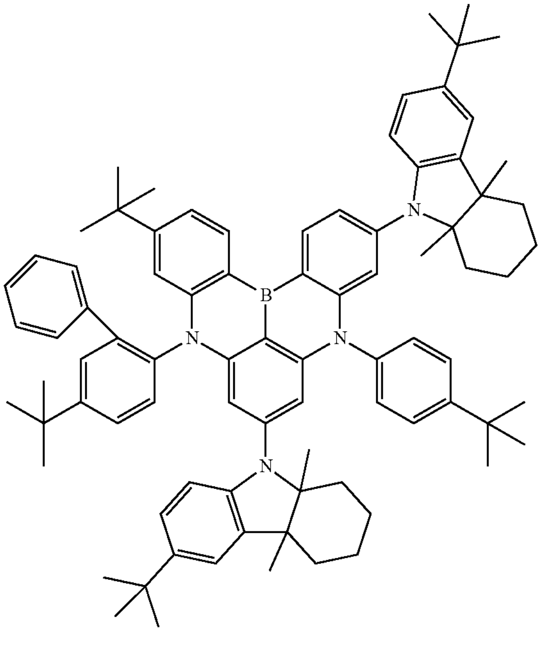

-continued
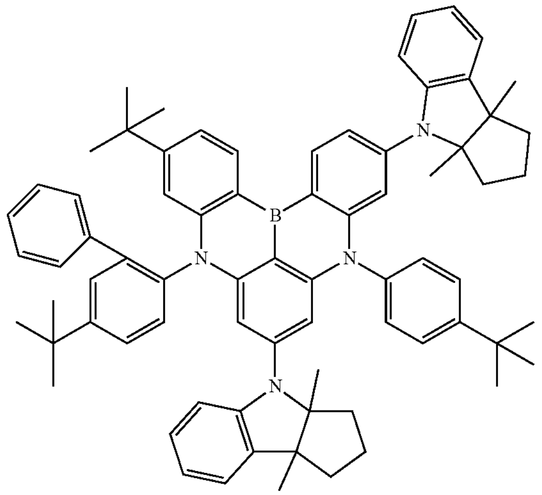
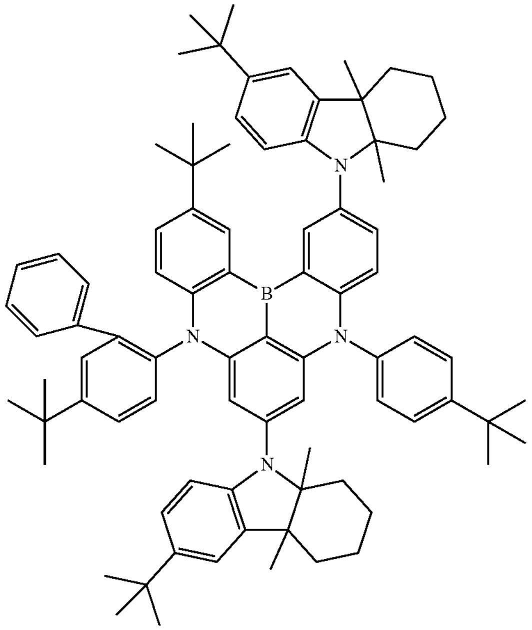
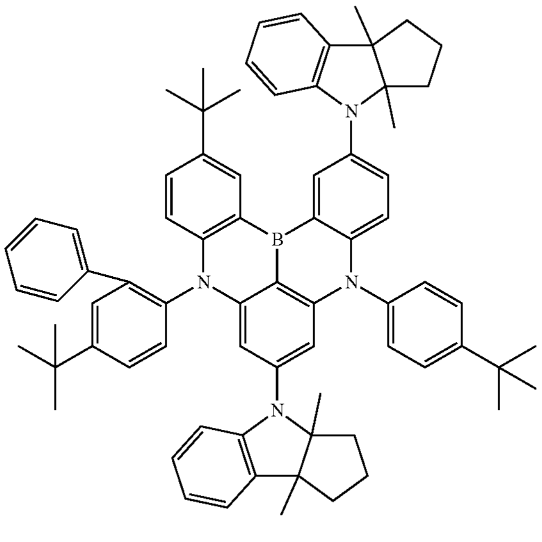
-continued
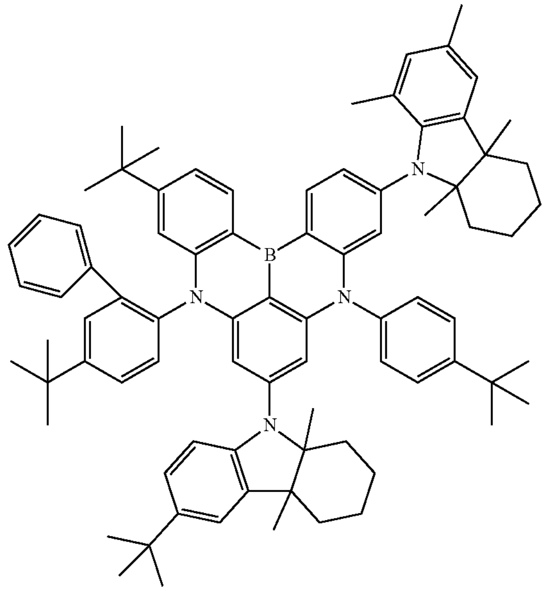
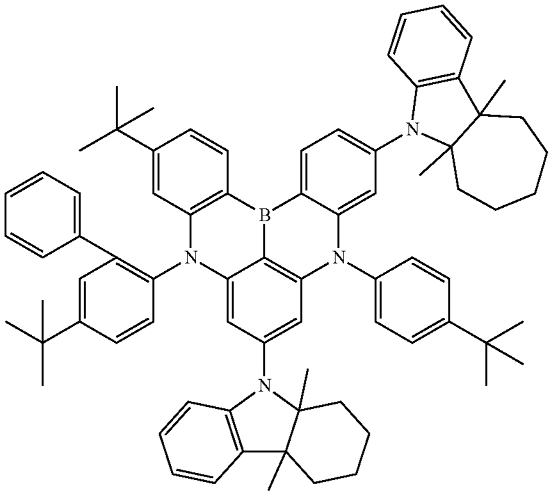
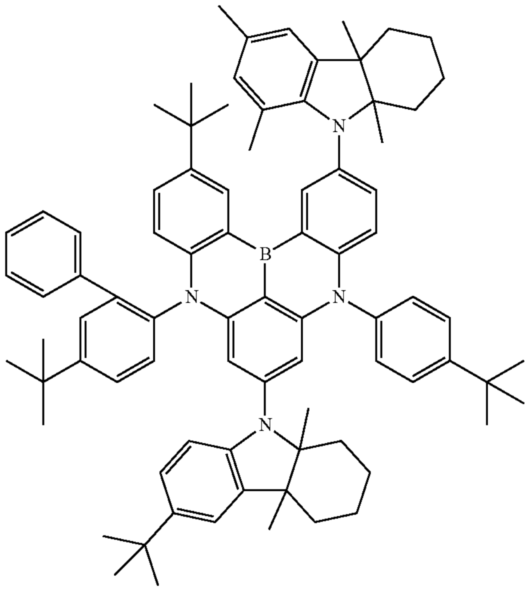

-continued
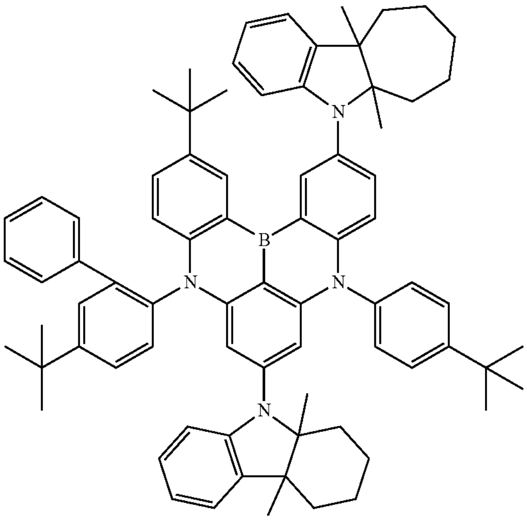
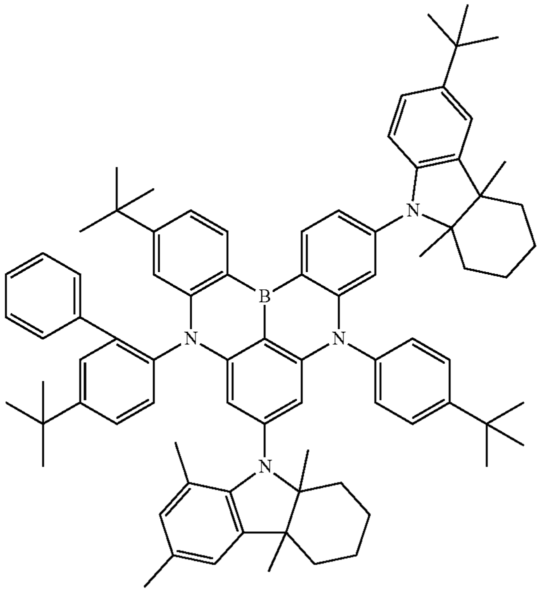
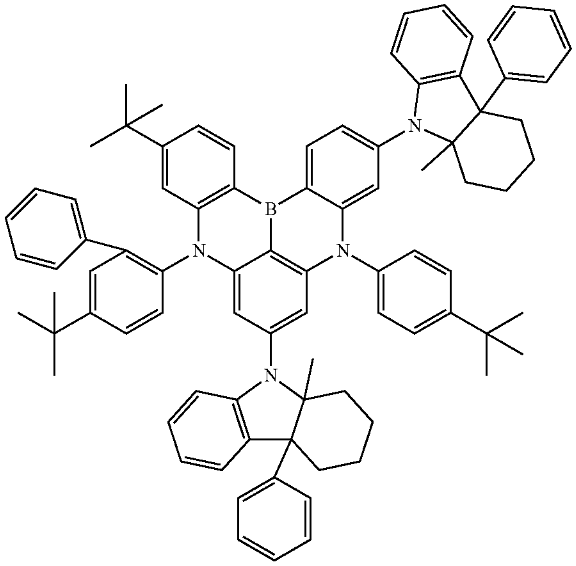
-continued
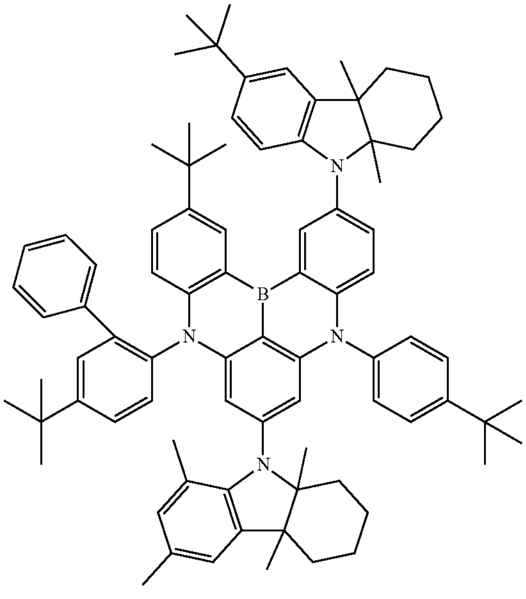
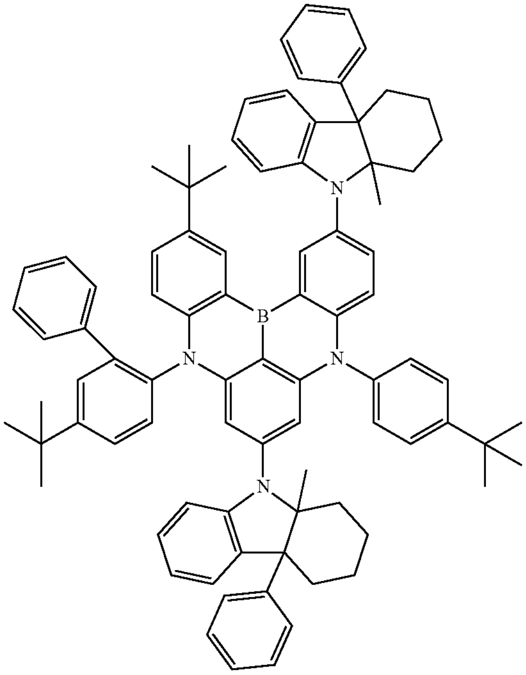

-continued
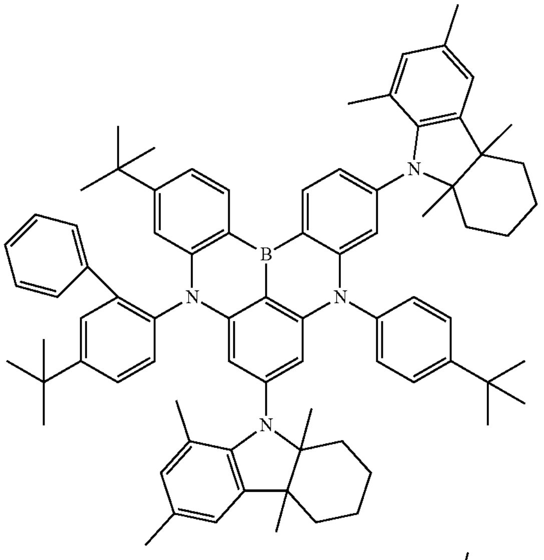
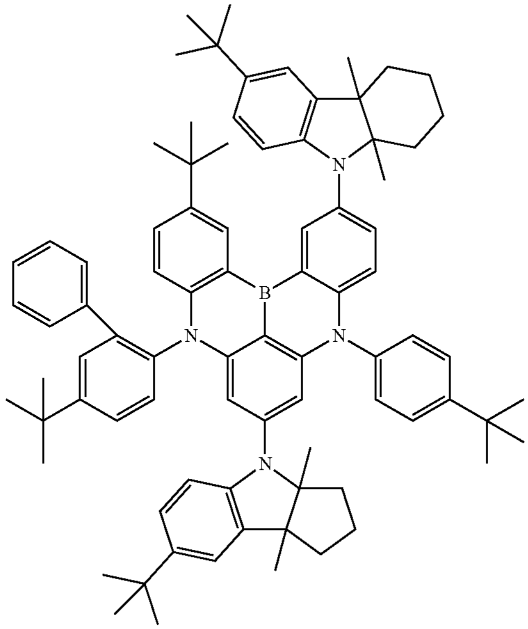
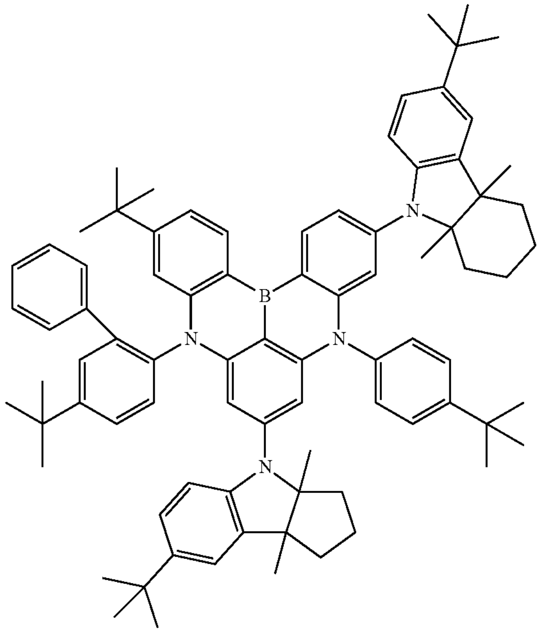
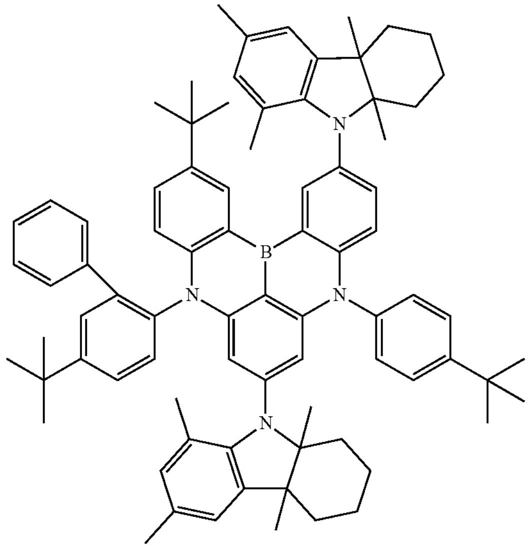
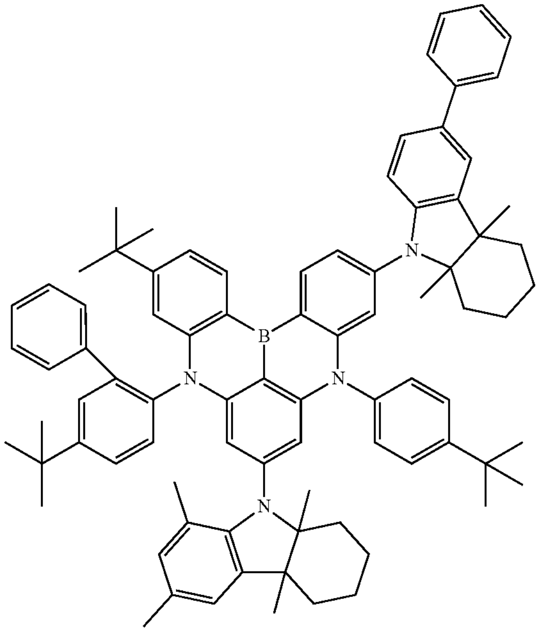

-continued
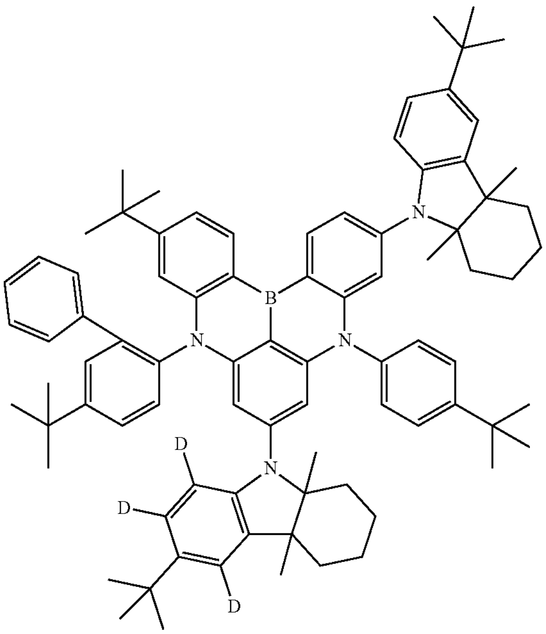
-continued
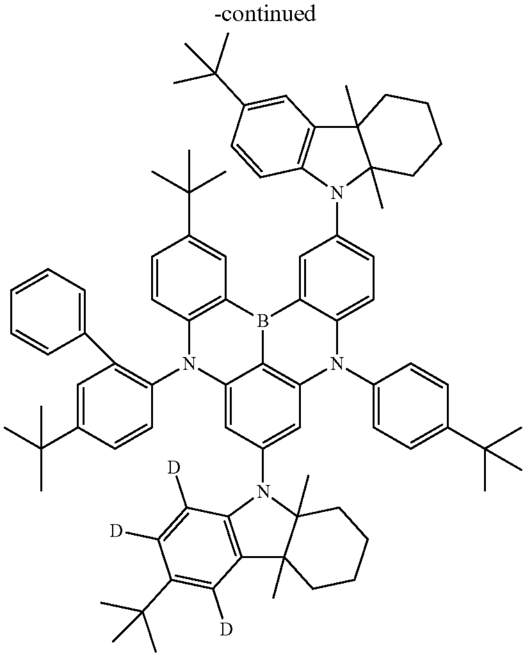
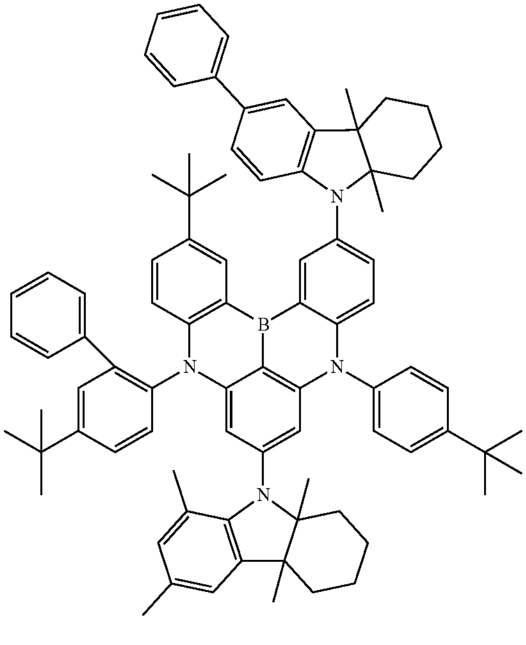
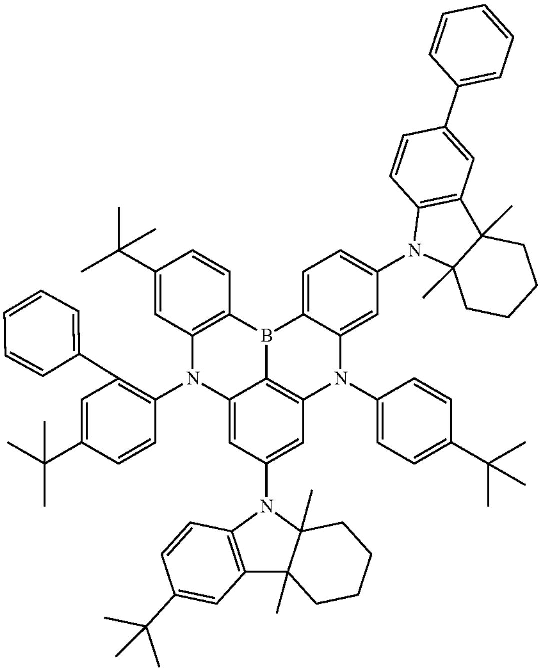

-continued
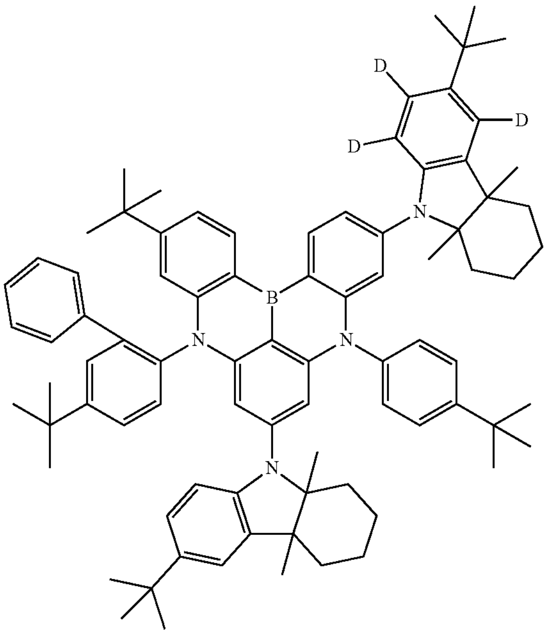
-continued
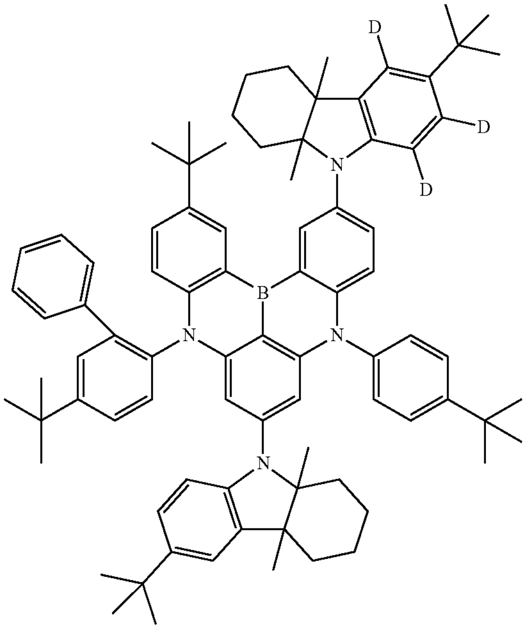
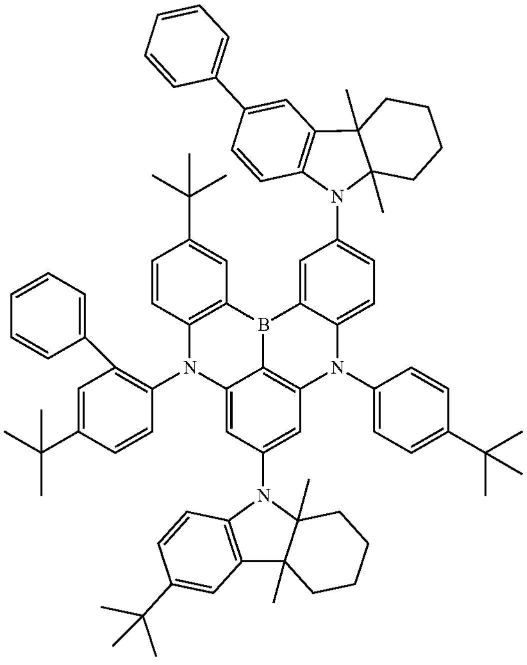
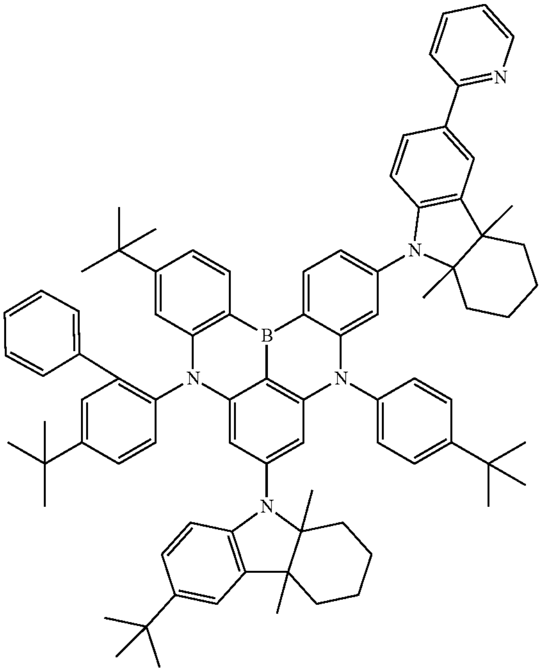

-continued
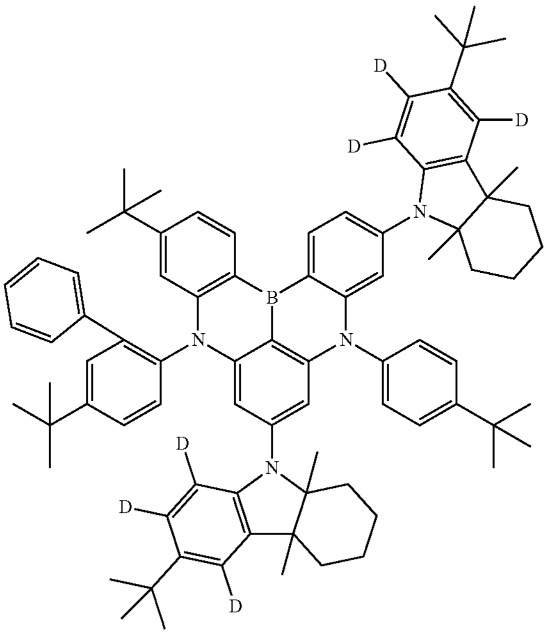
-continued
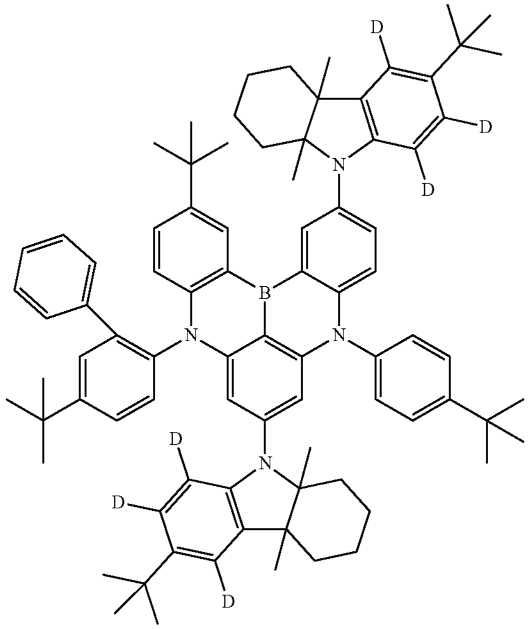
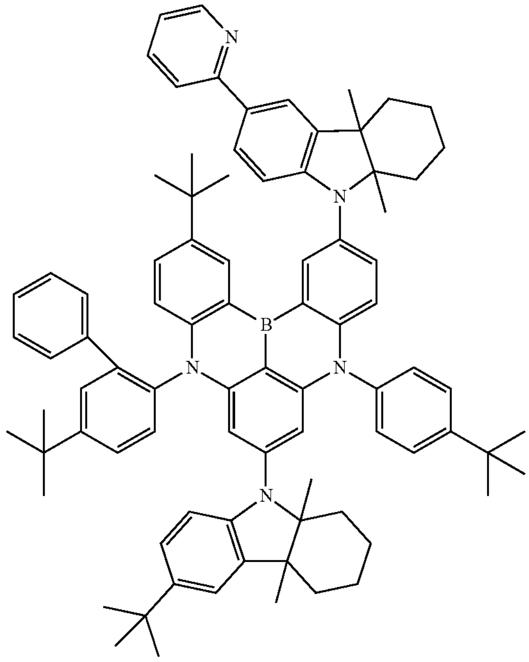
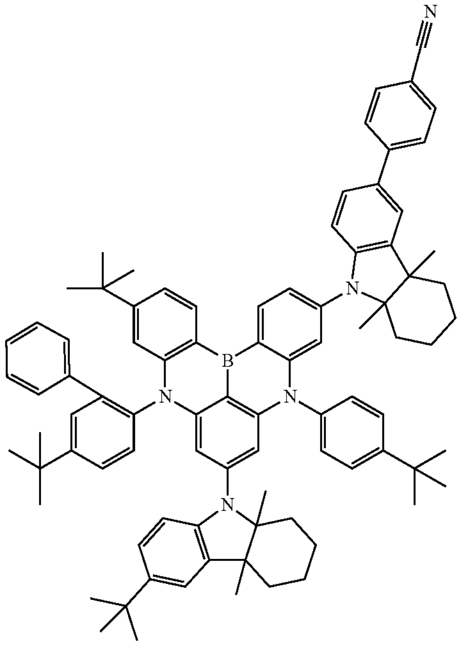

-continued
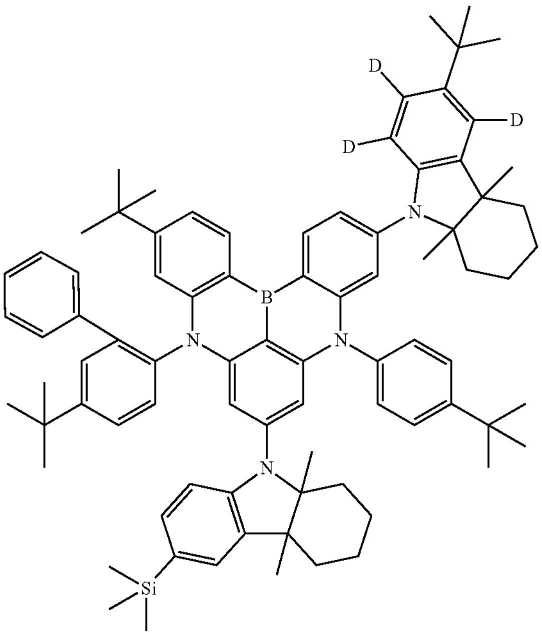
-continued
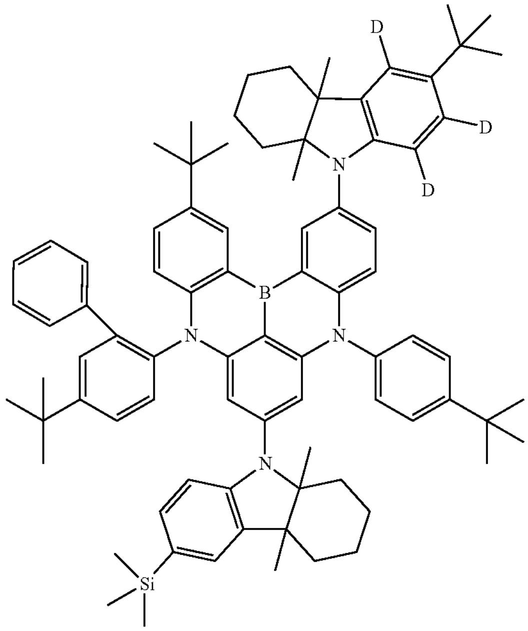
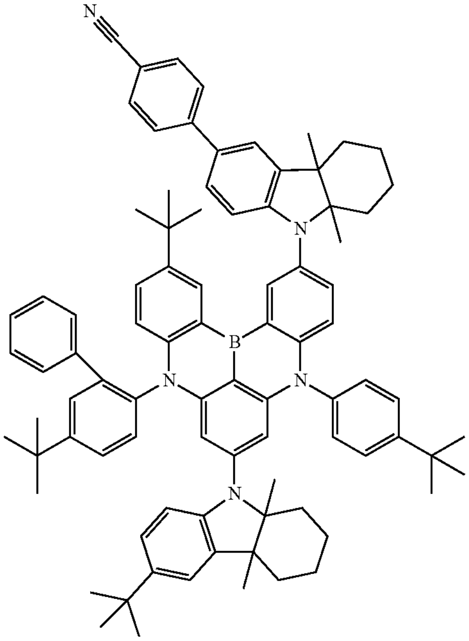
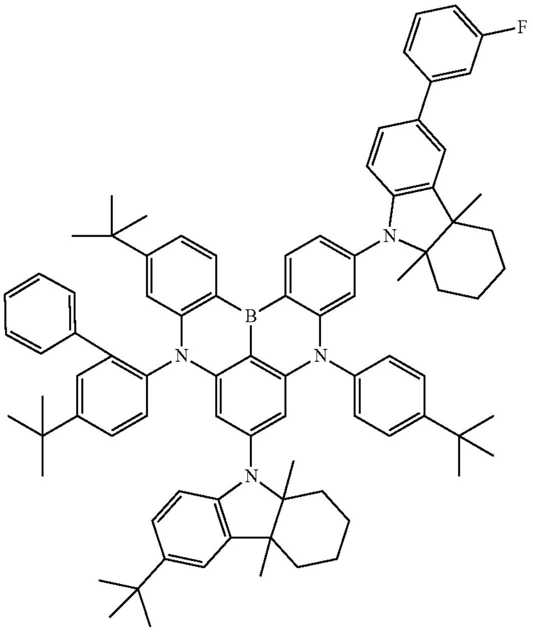

-continued
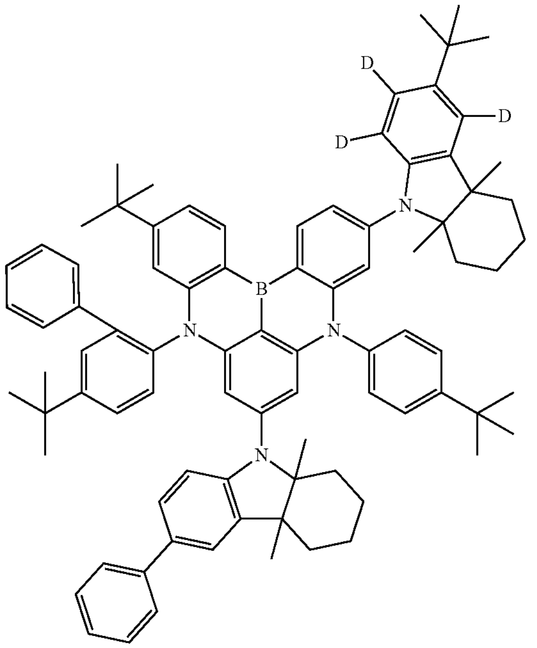
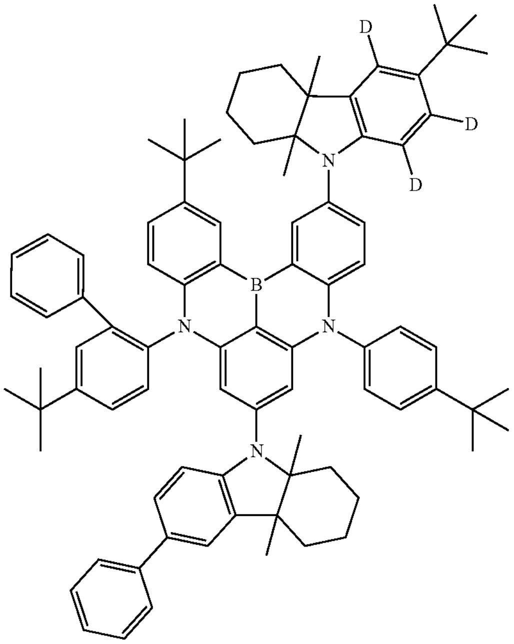
-continued
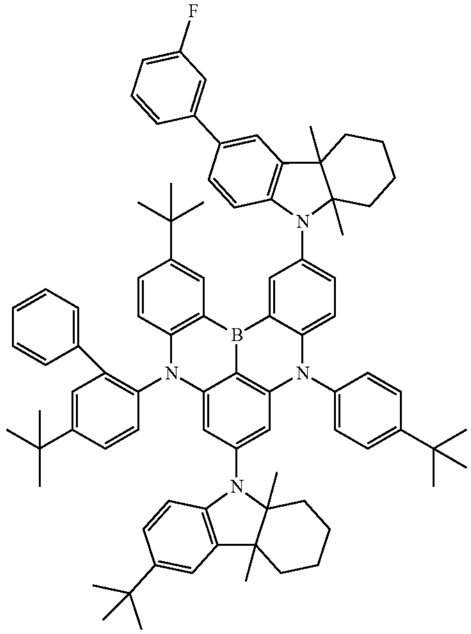
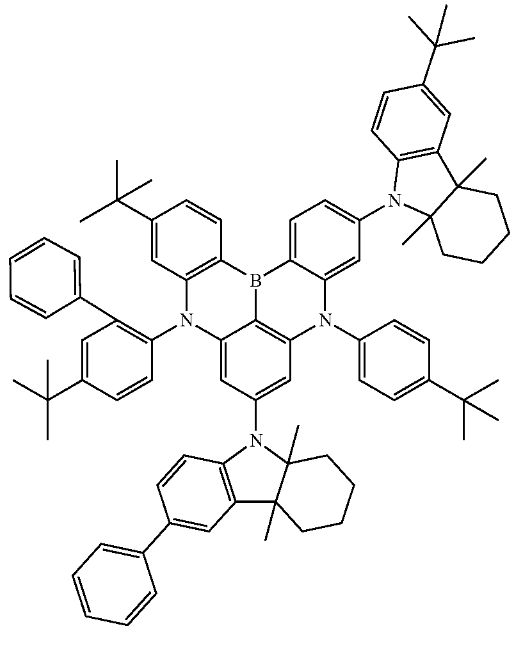

-continued
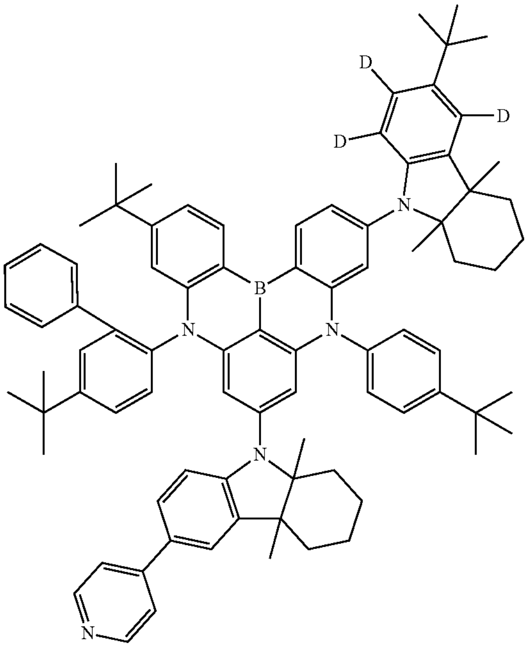
-continued
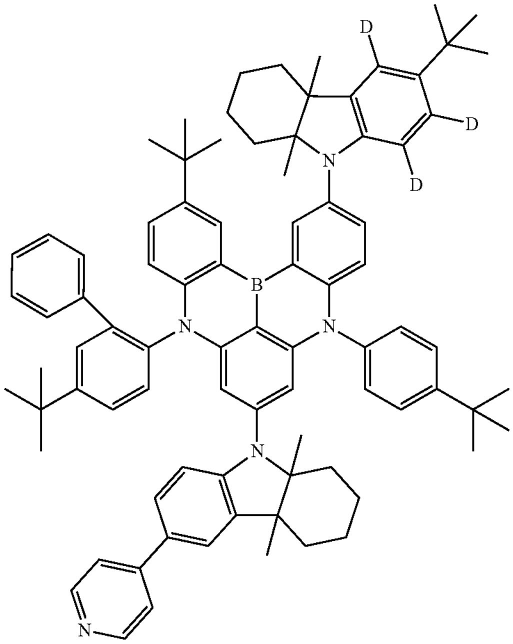
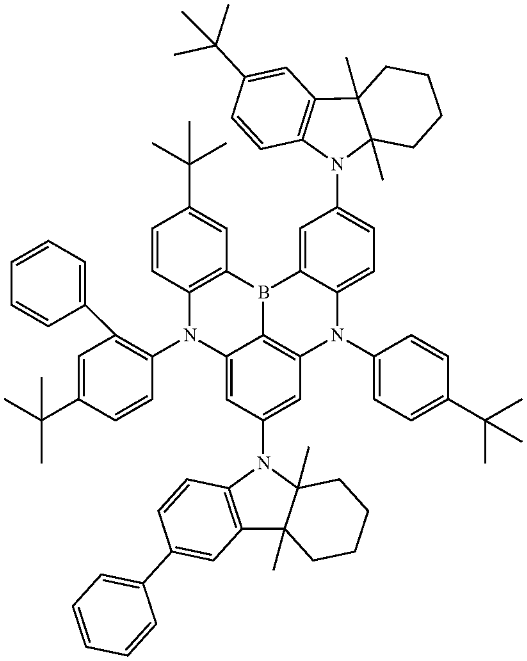
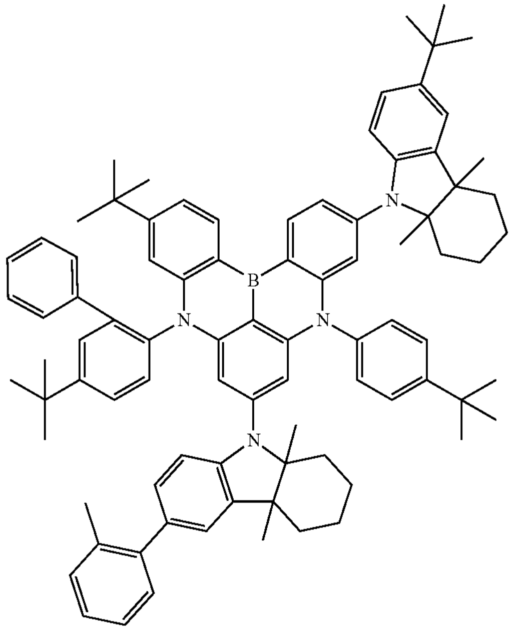

-continued
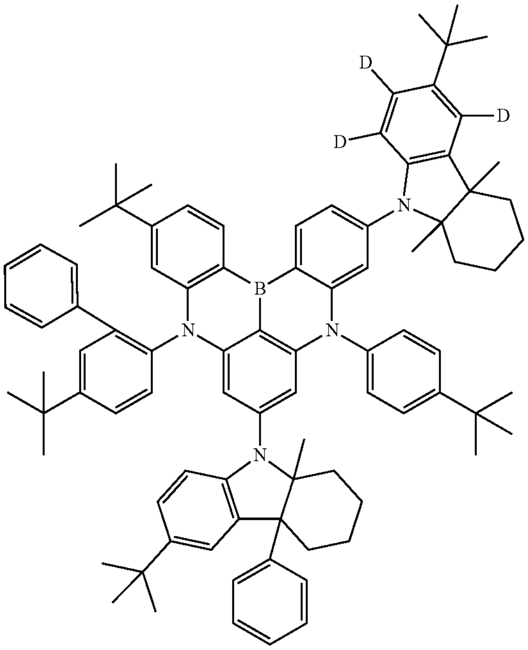
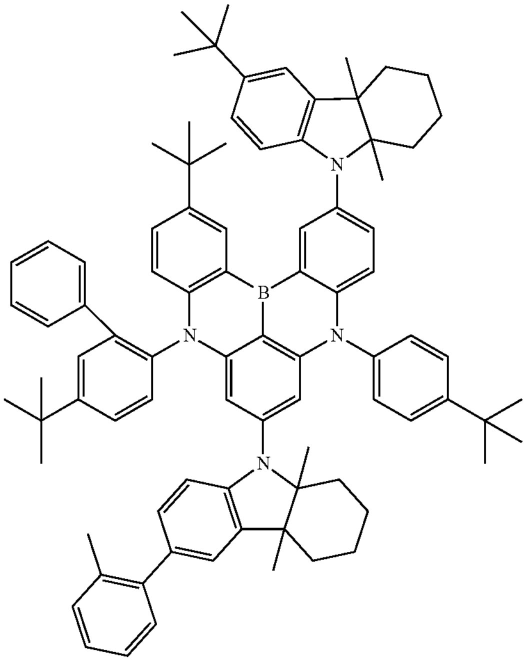
-continued
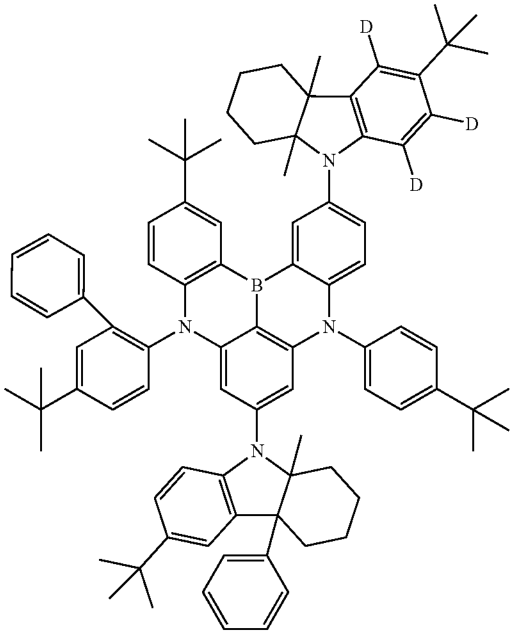
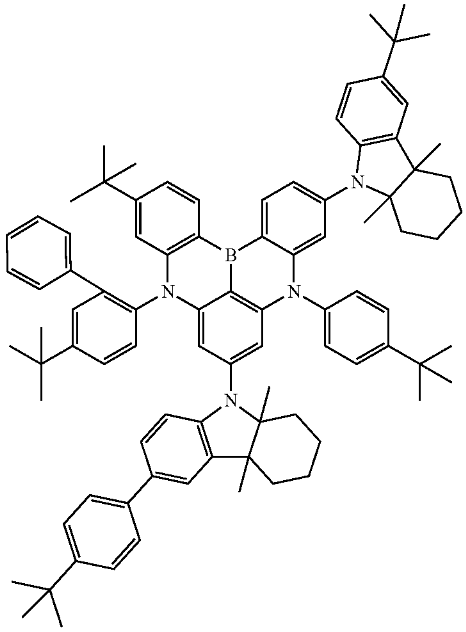

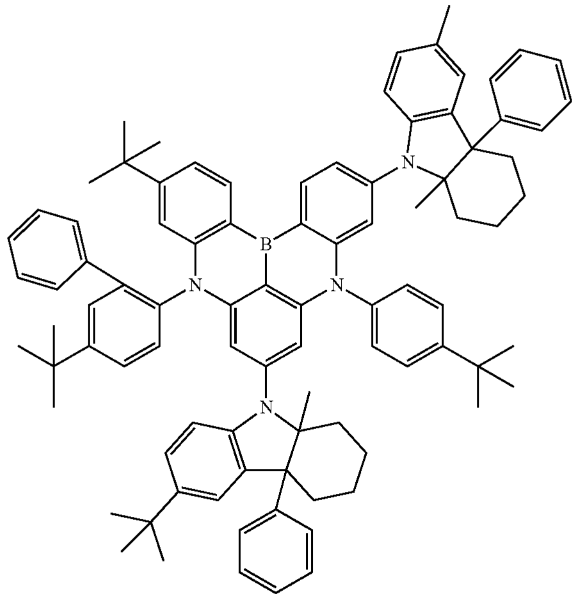
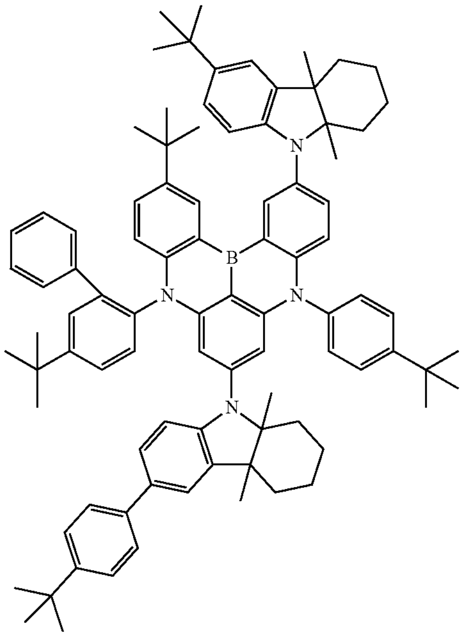
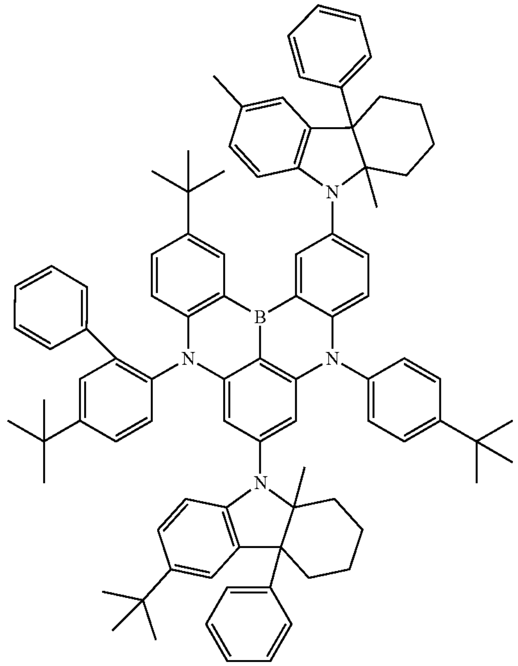
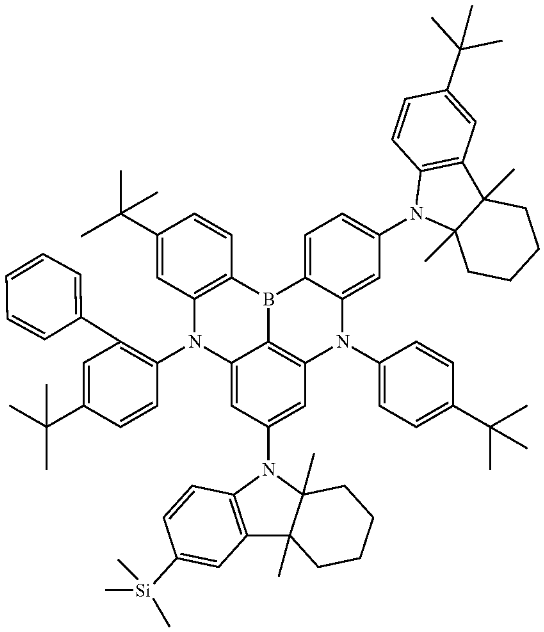

-continued
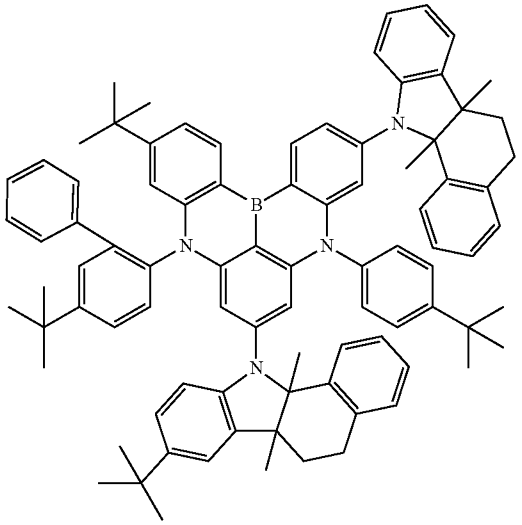
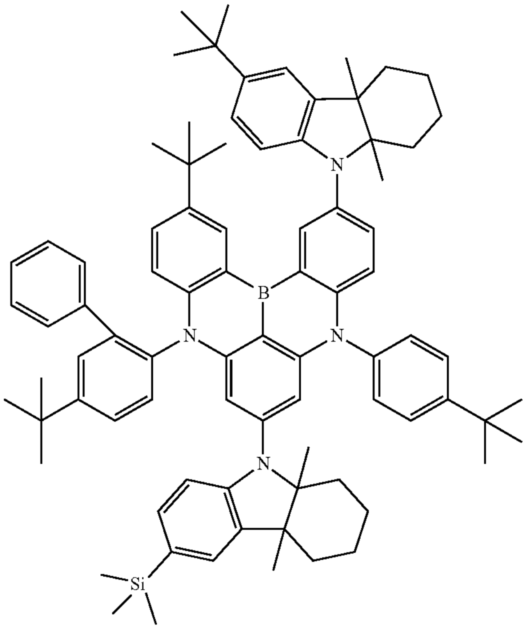
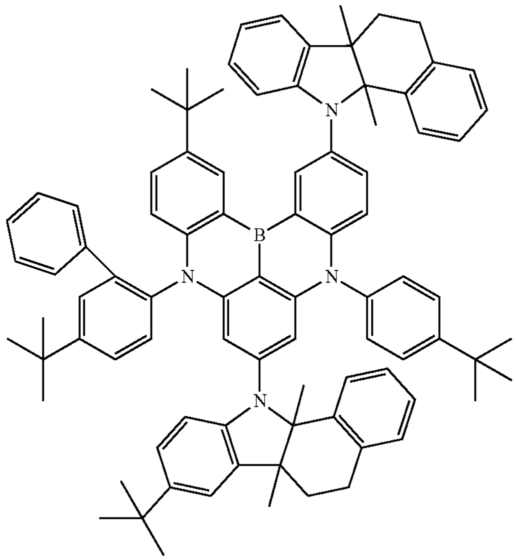
-continued
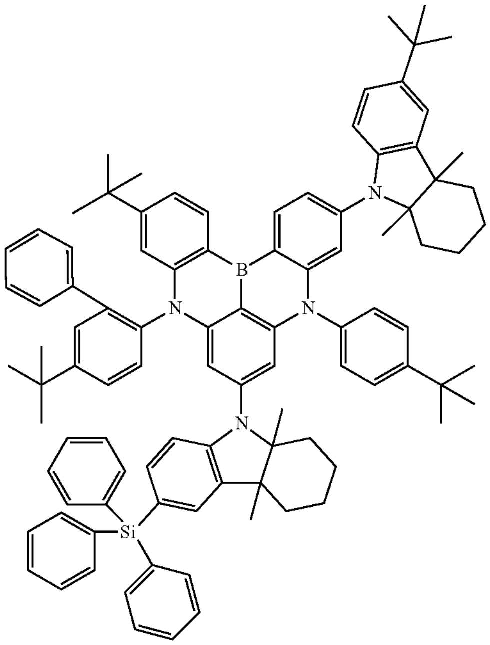
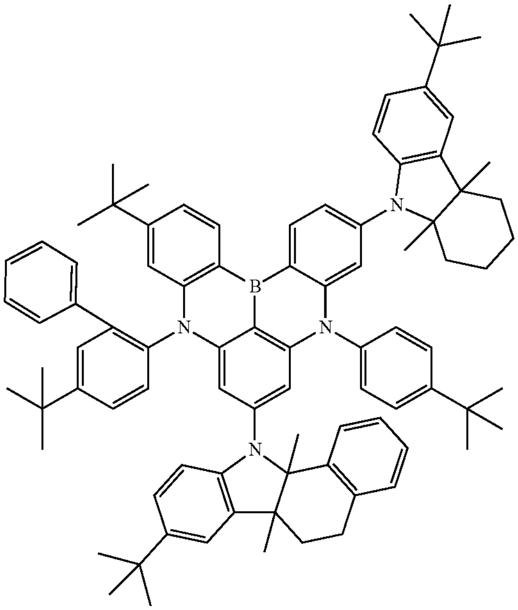

-continued
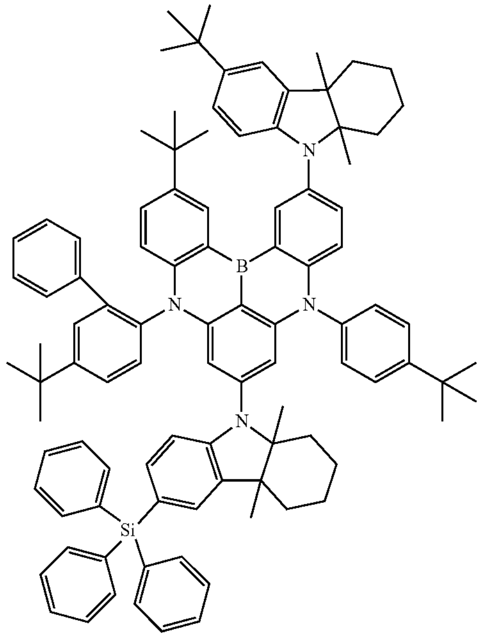
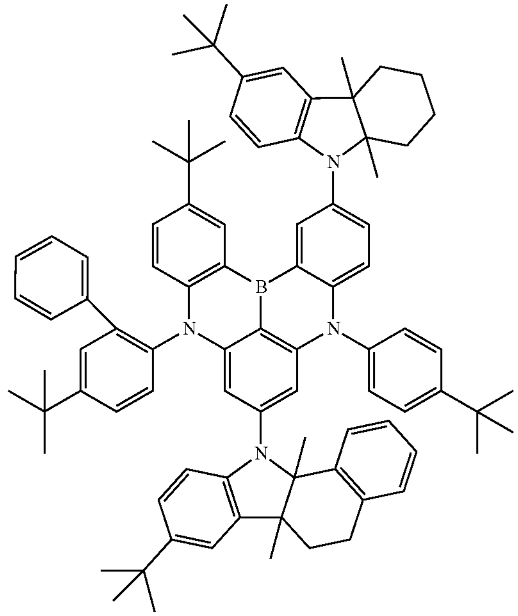
-continued
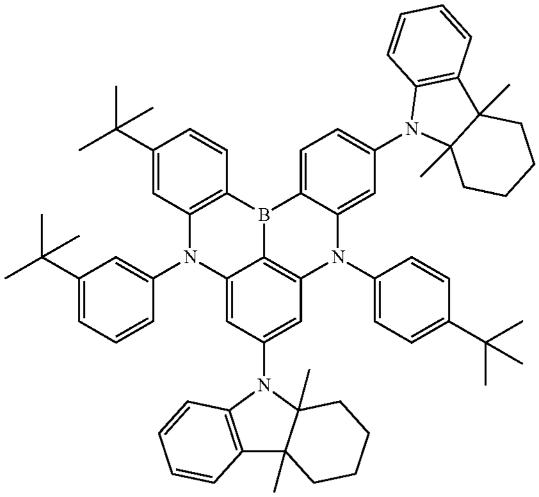
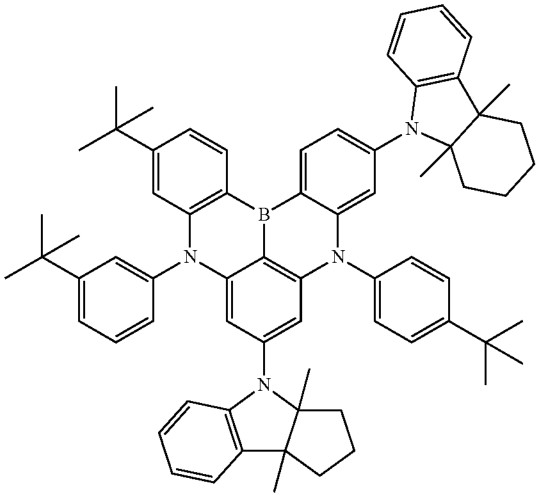
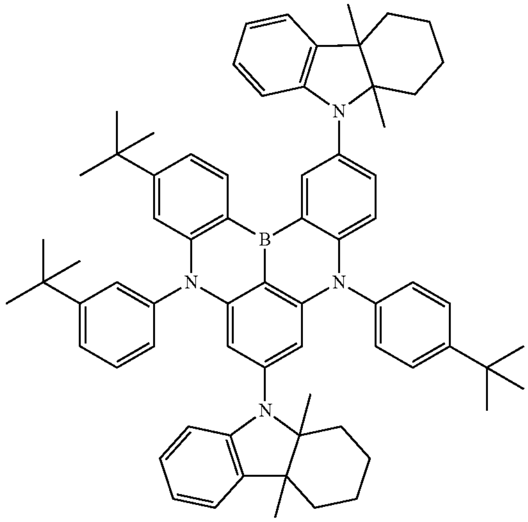

-continued
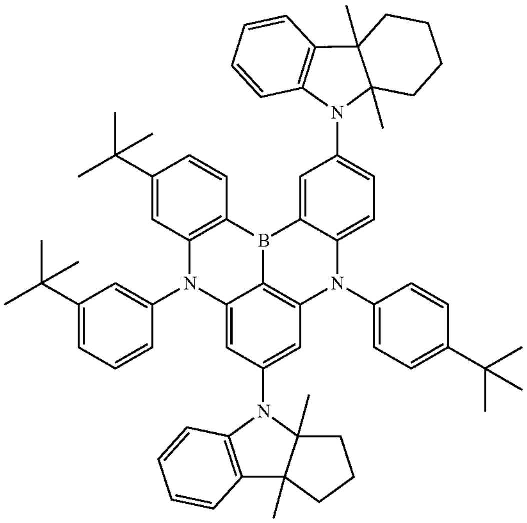
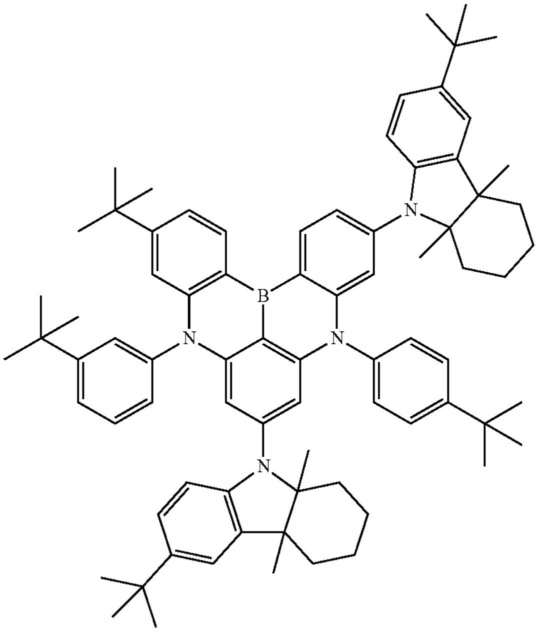
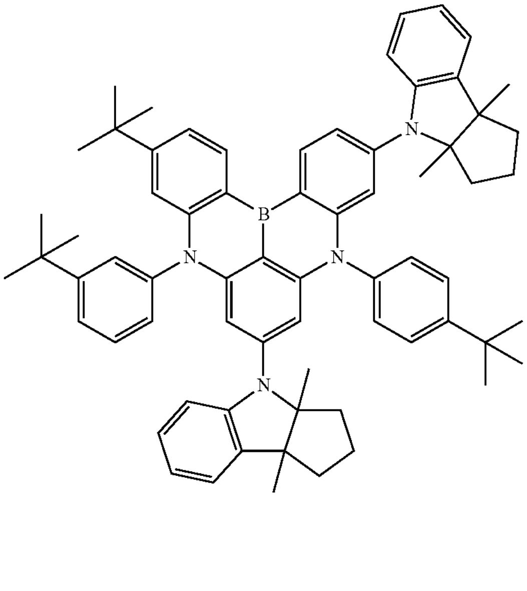
-continued
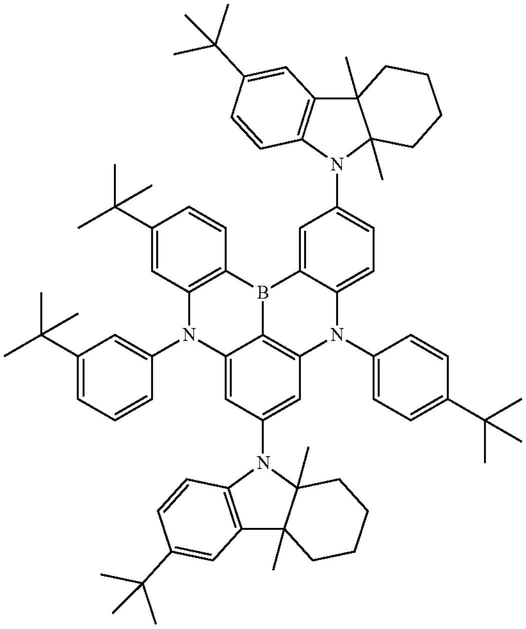
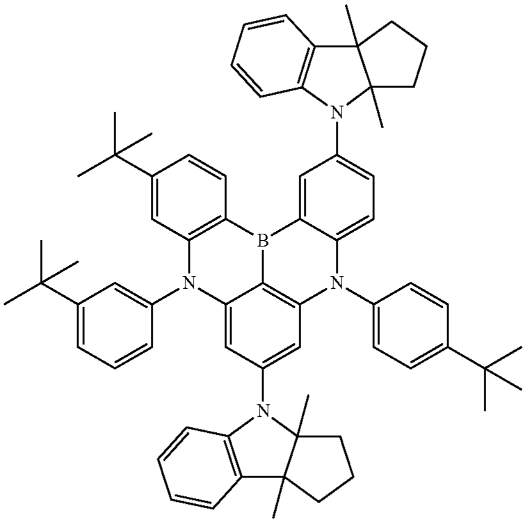

-continued
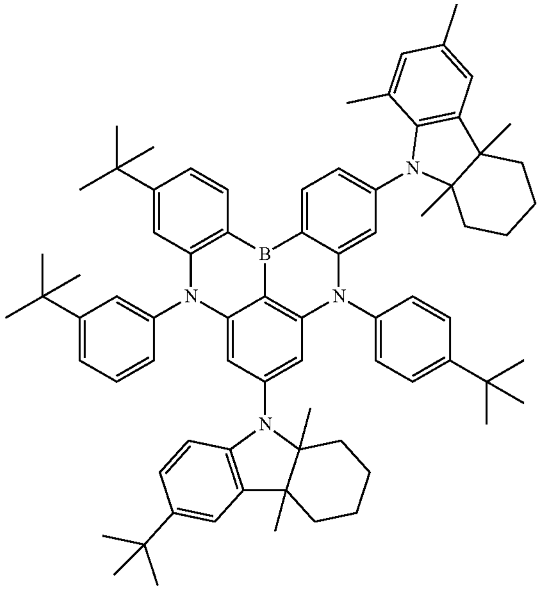
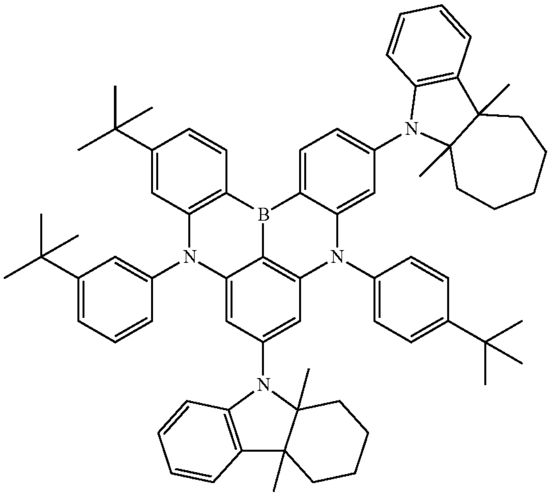
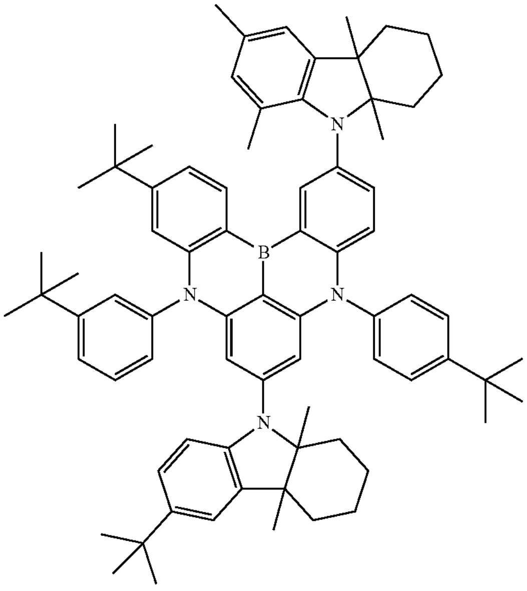
-continued
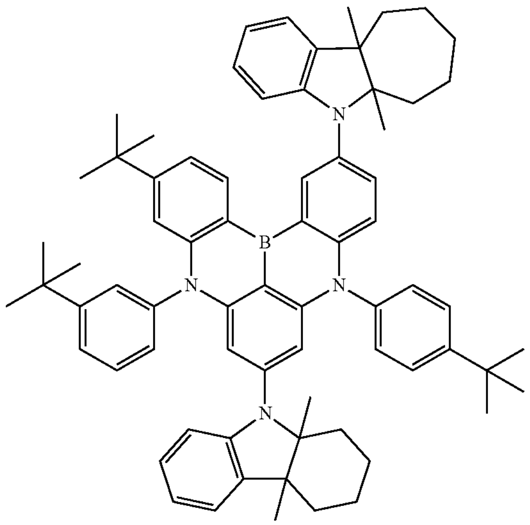
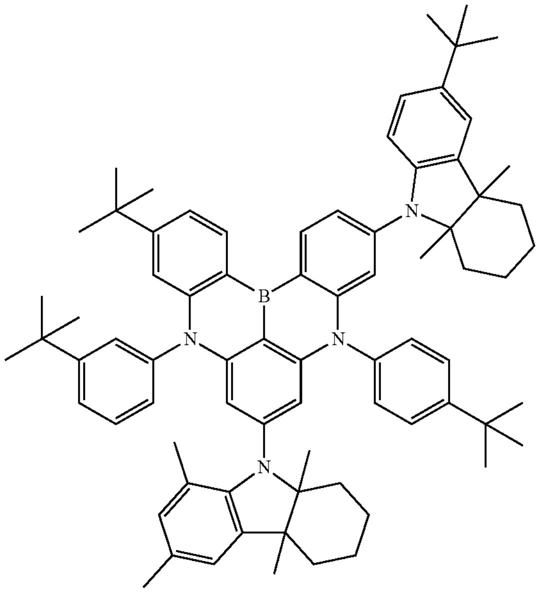
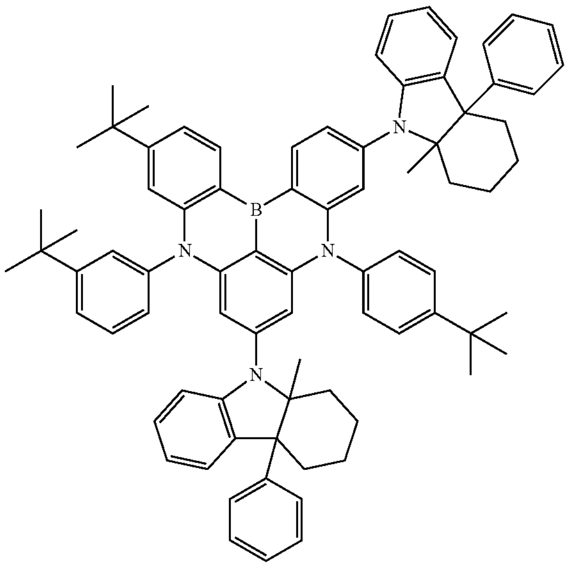

-continued
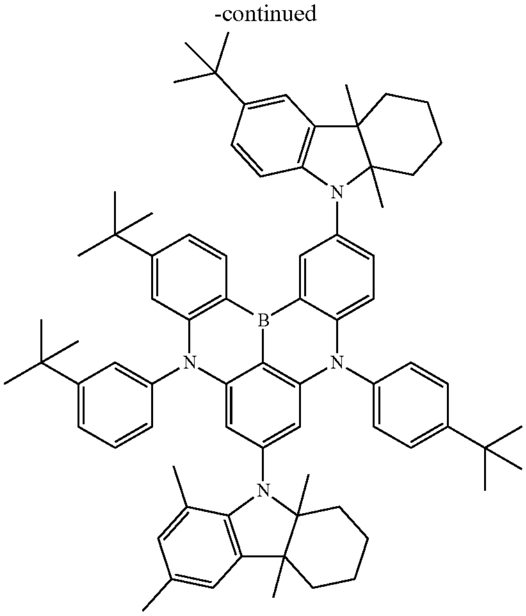
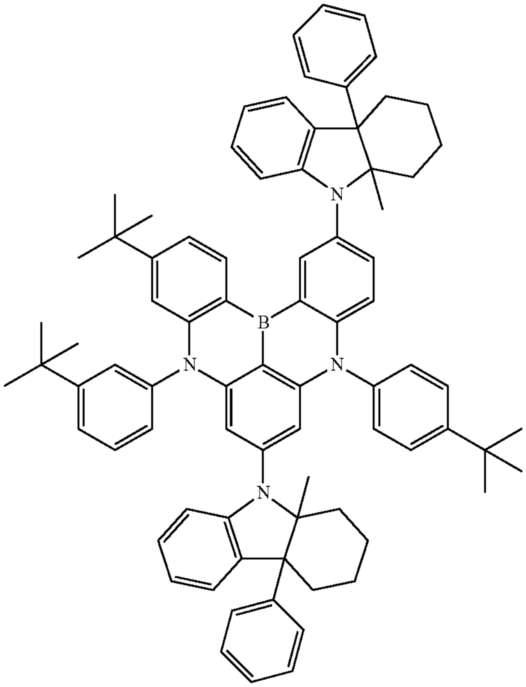
-continued
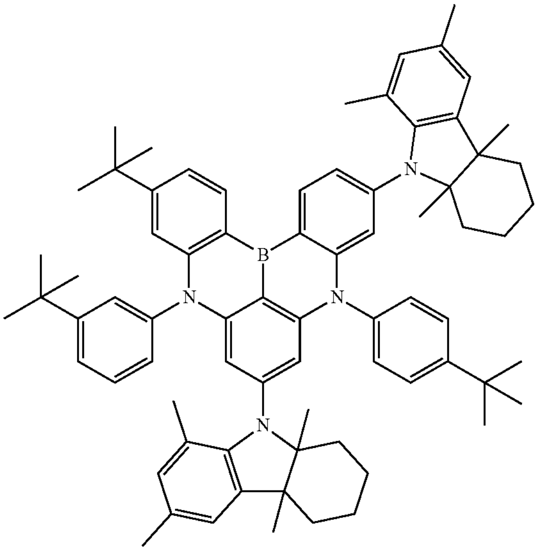
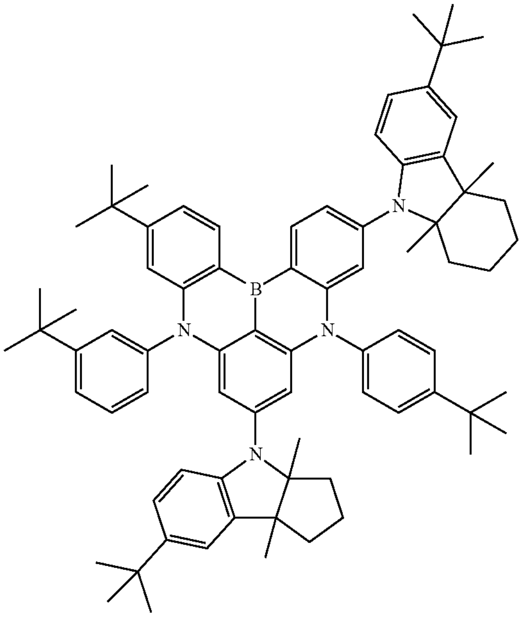
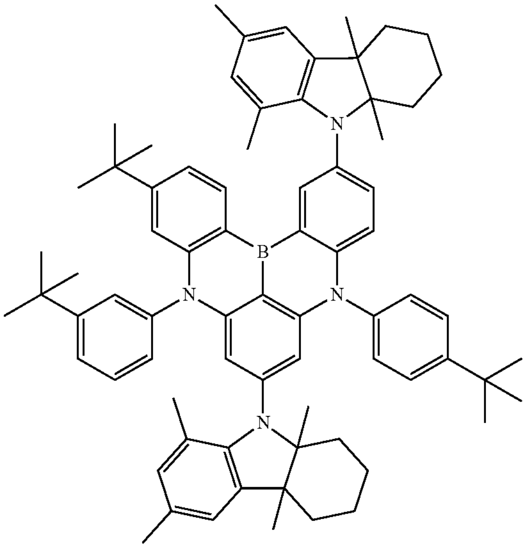

-continued
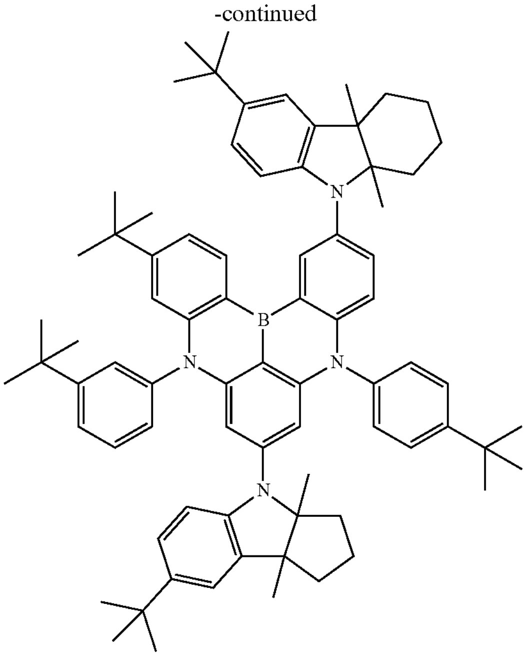
-continued
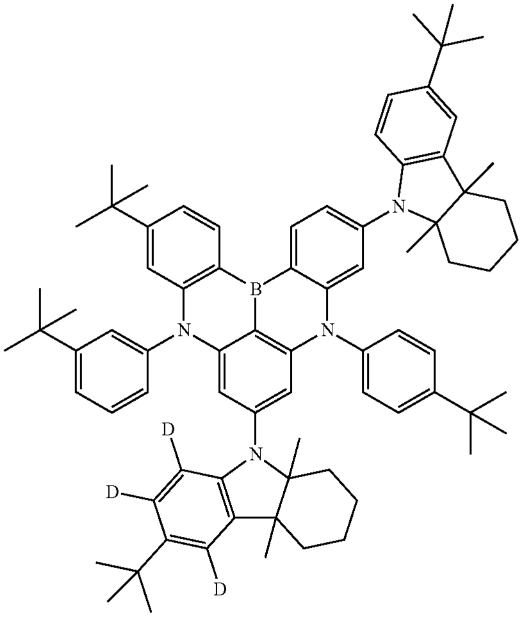
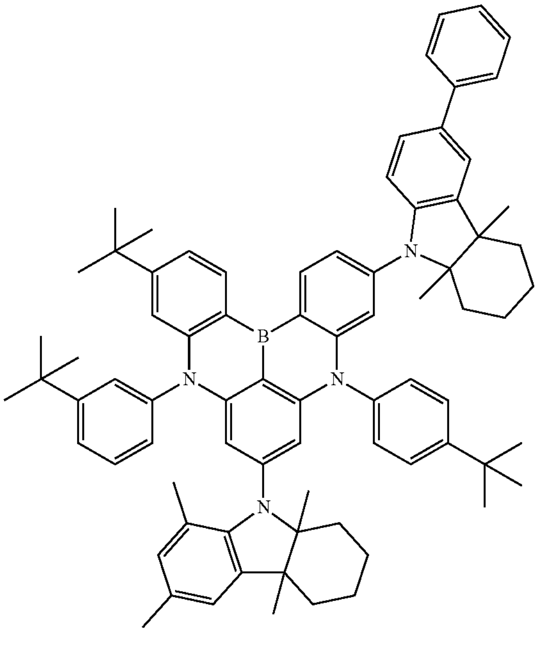
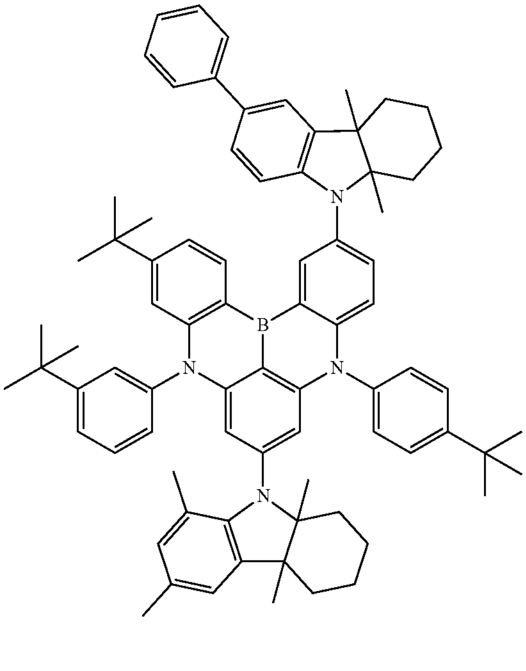

-continued
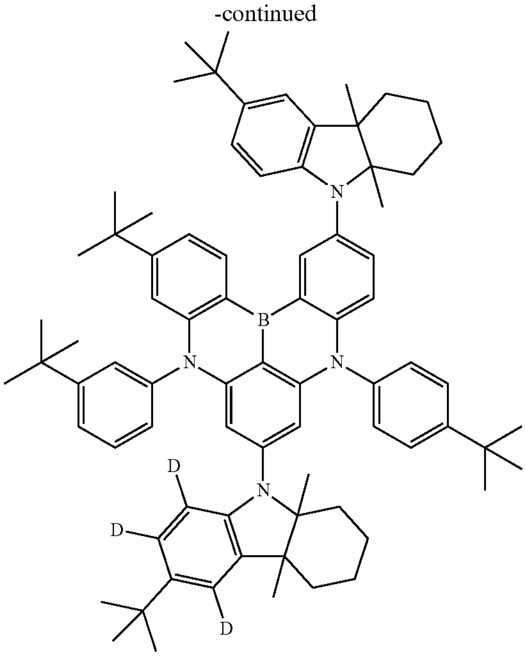
-continued
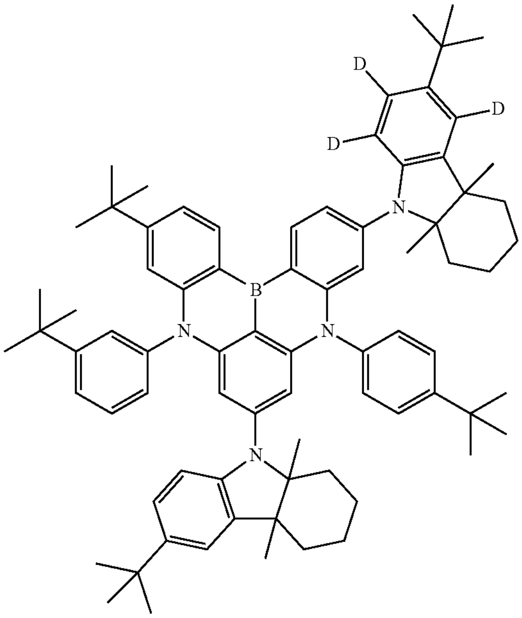
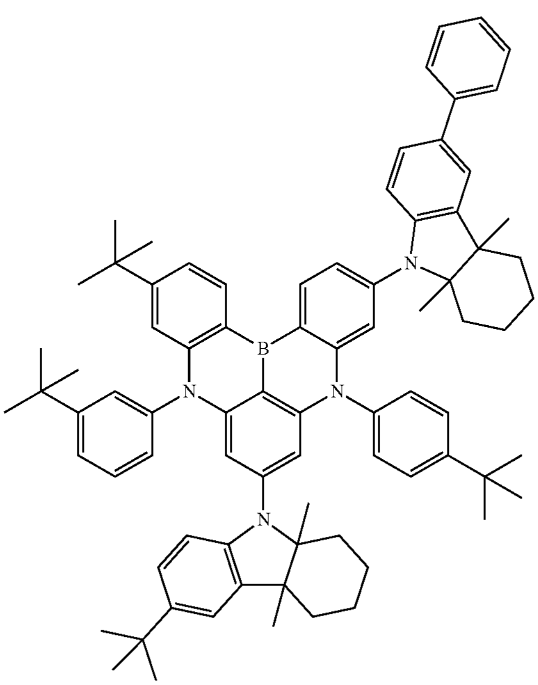
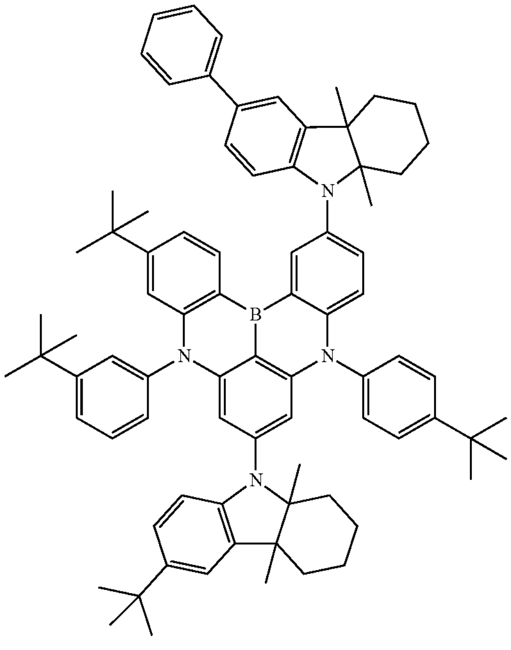

-continued
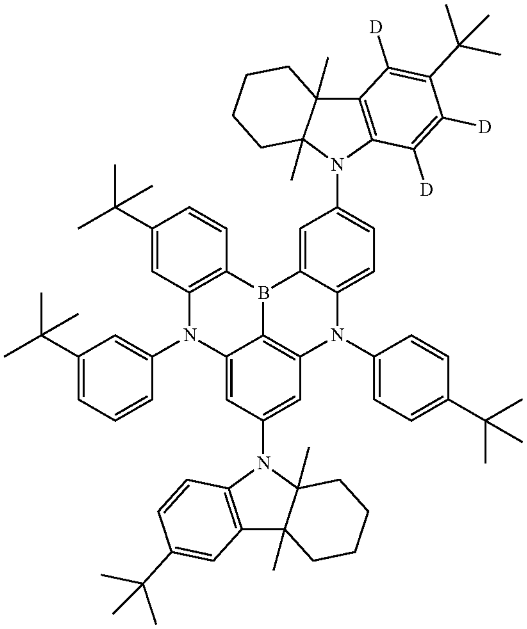
-continued
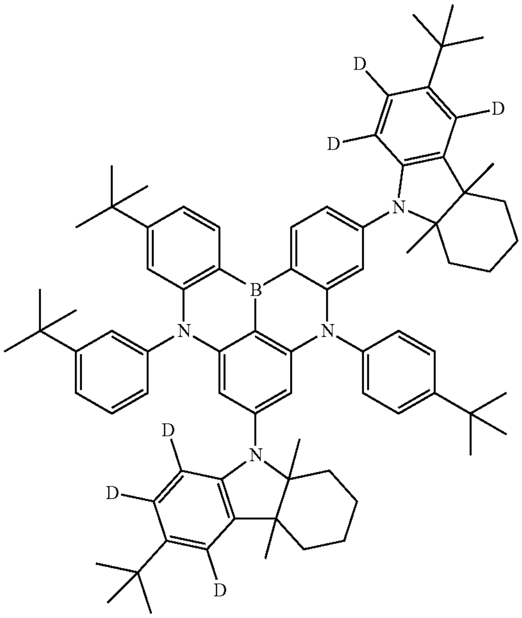
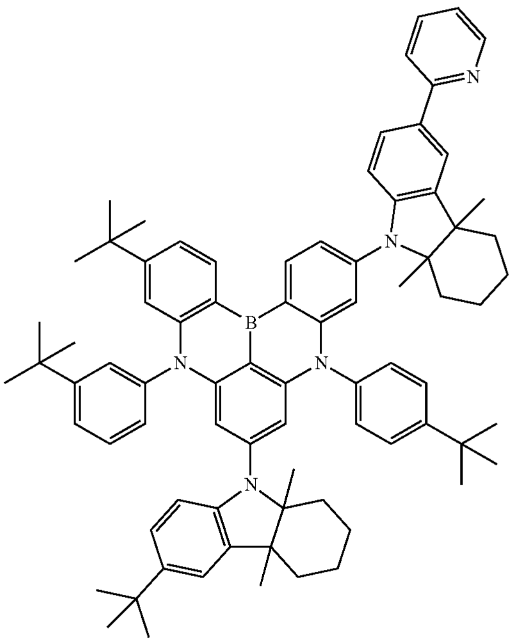
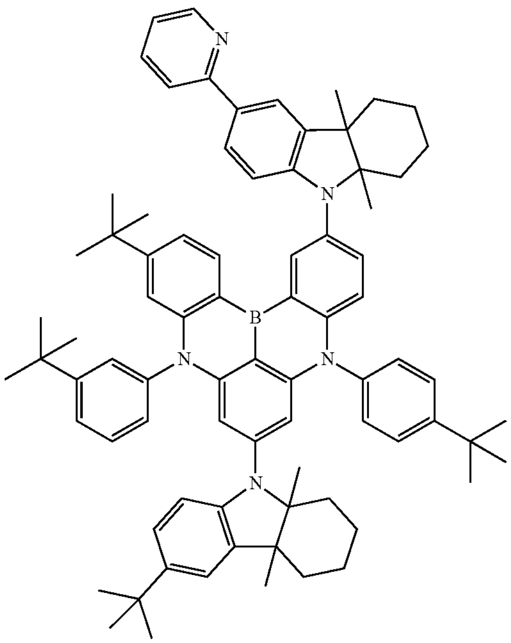

-continued
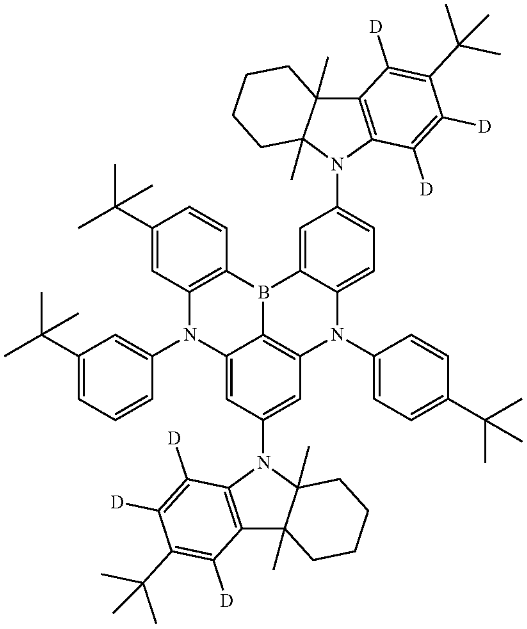
-continued
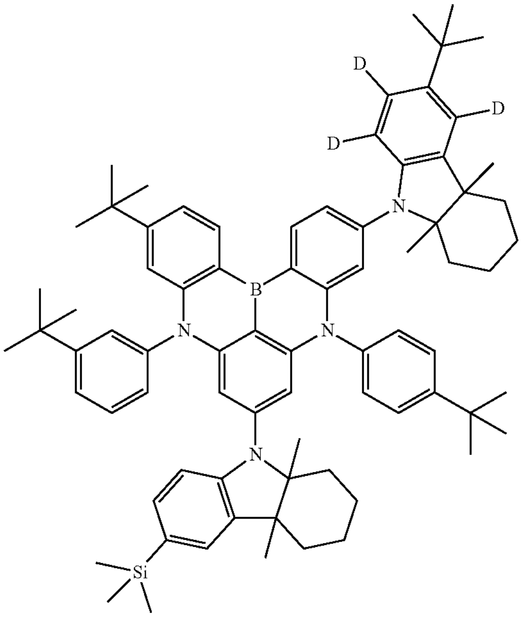
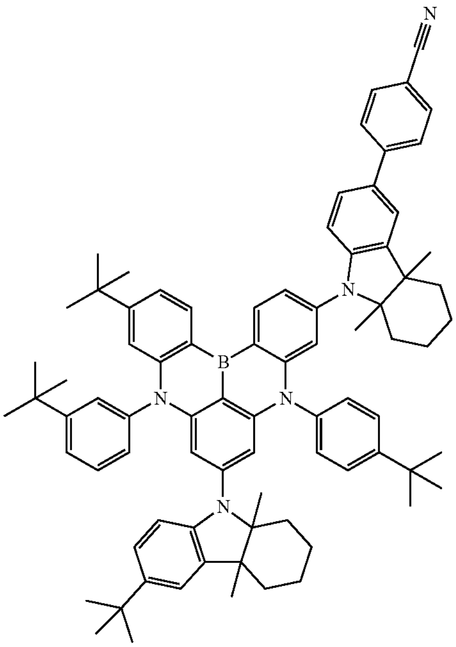
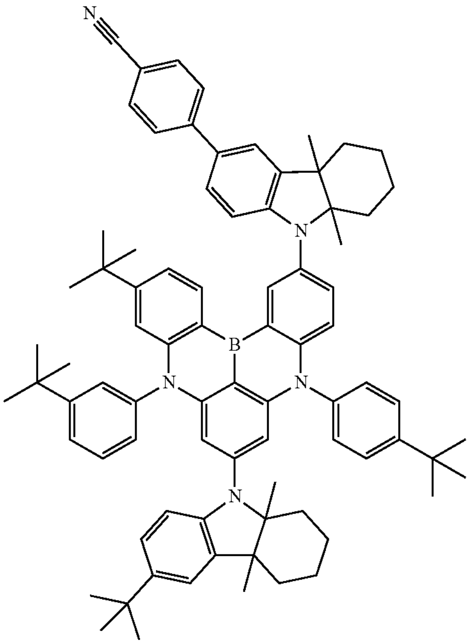

-continued
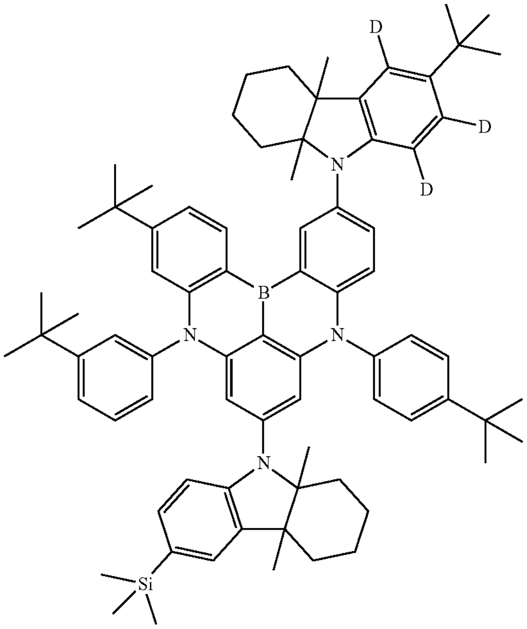
-continued
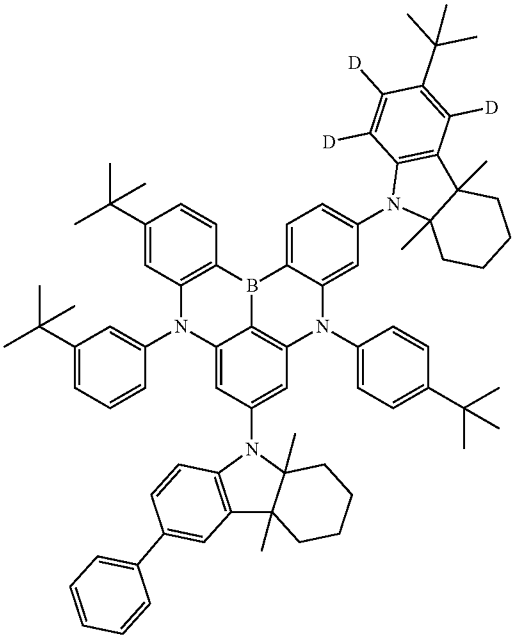
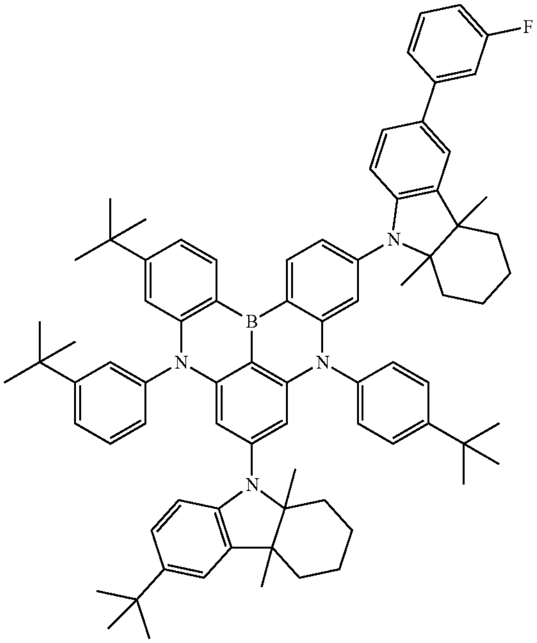
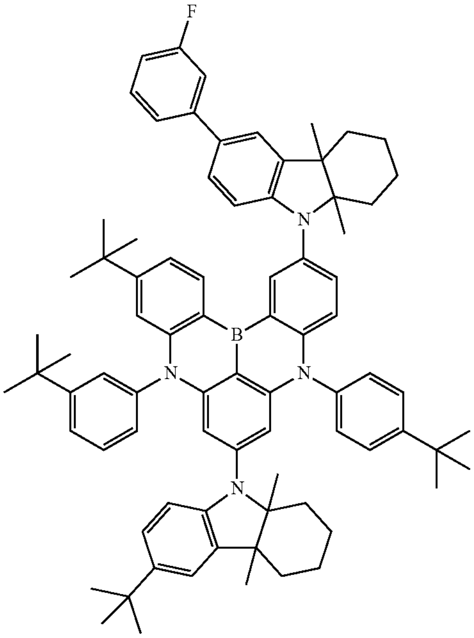

-continued
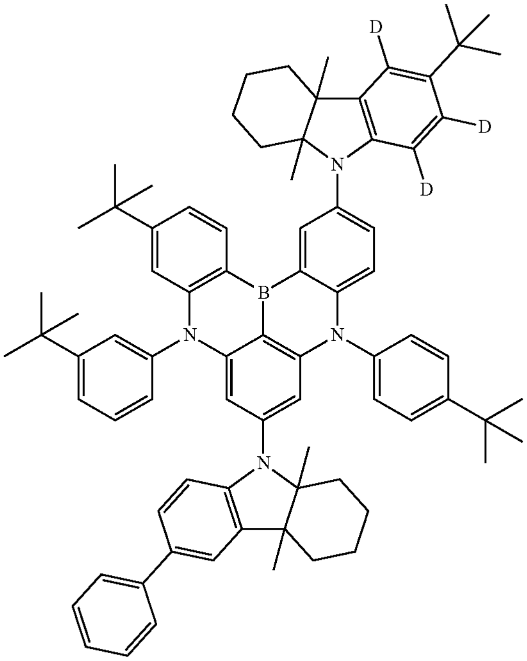
-continued
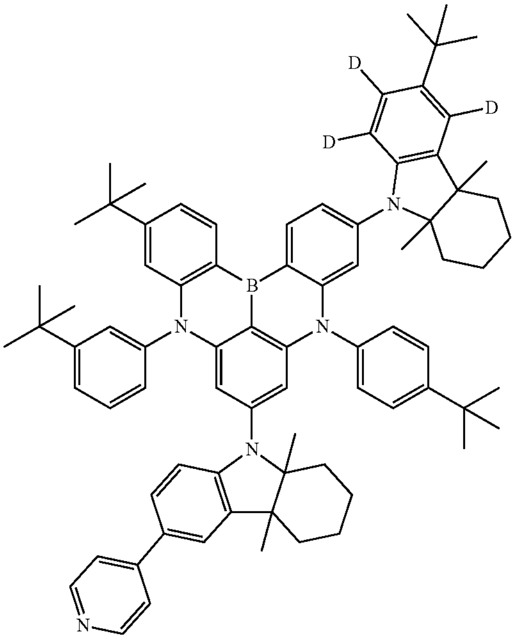
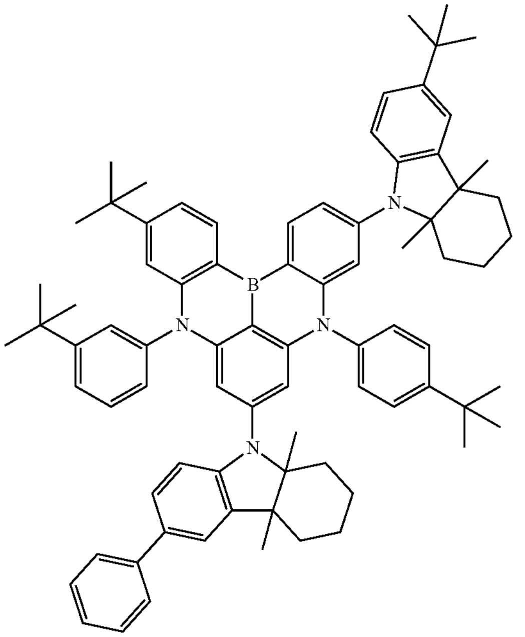
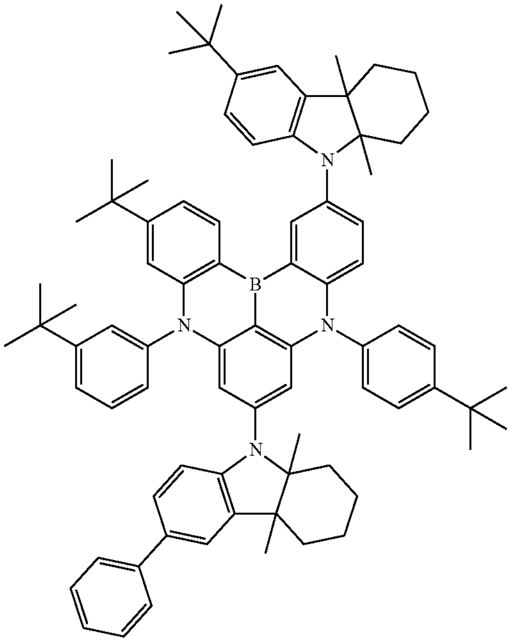

-continued
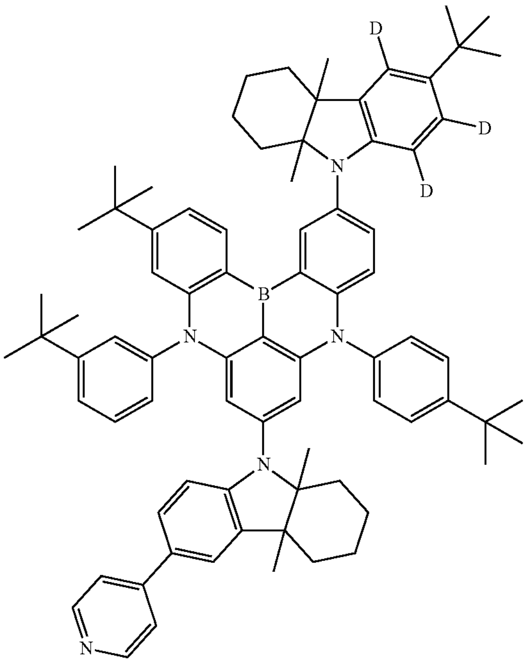
-continued
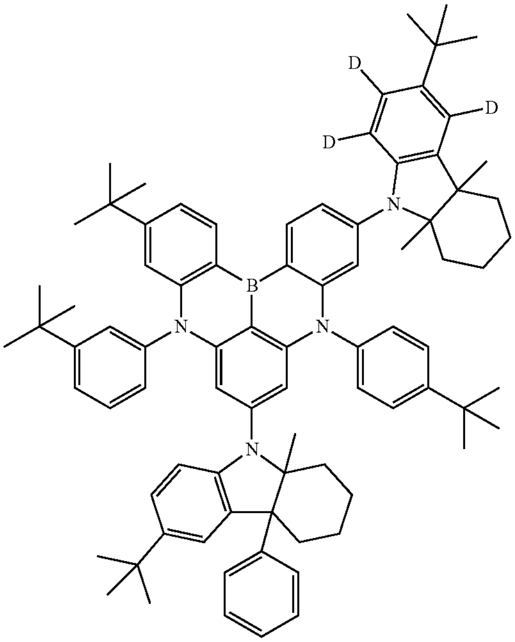
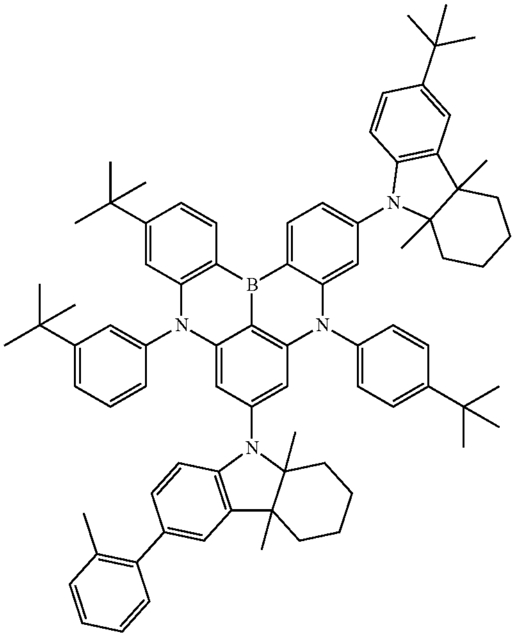
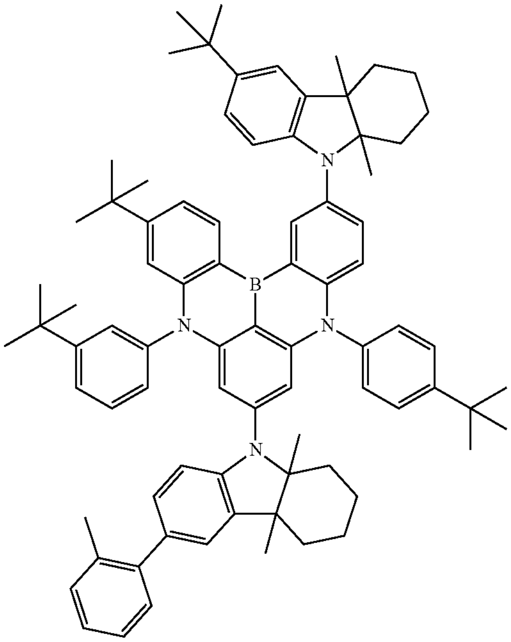

-continued
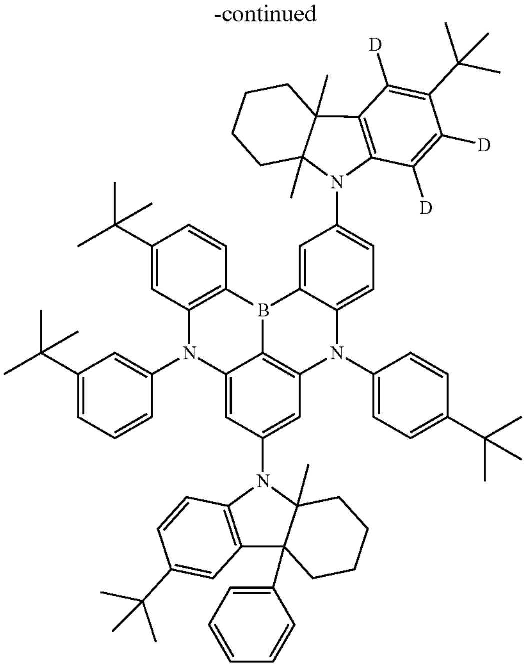
-continued
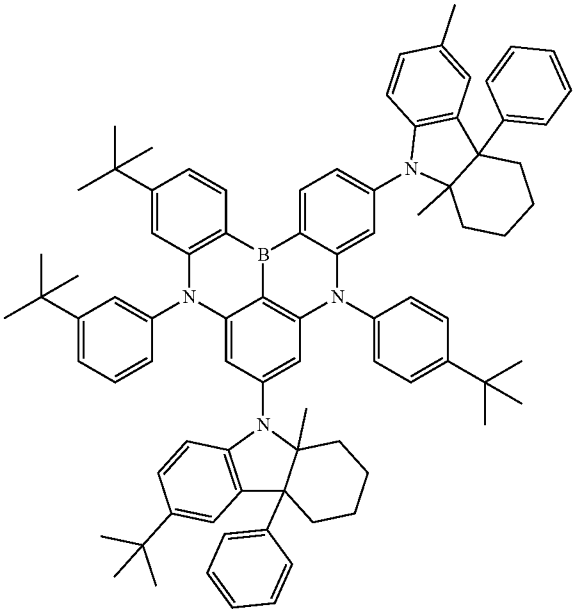
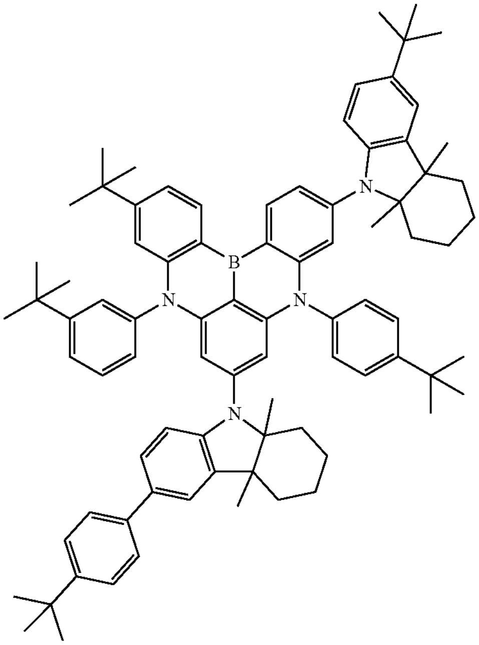
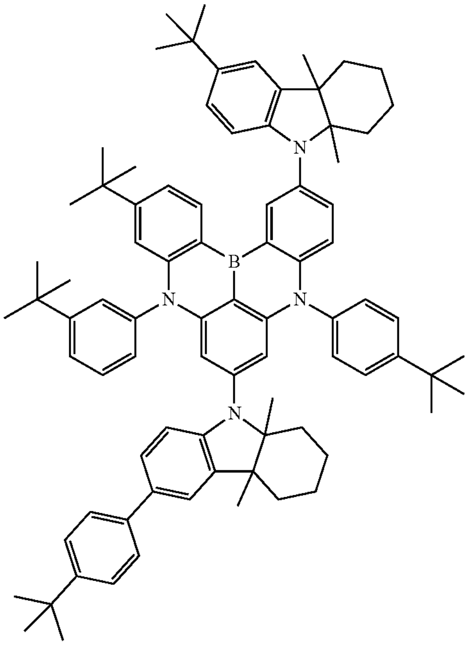

-continued
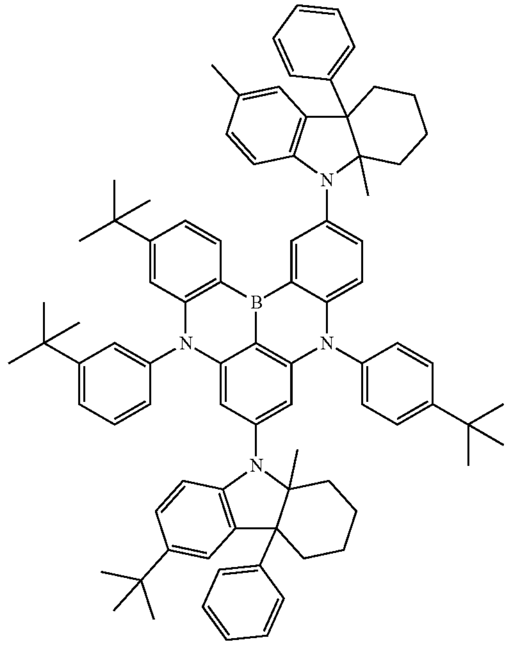
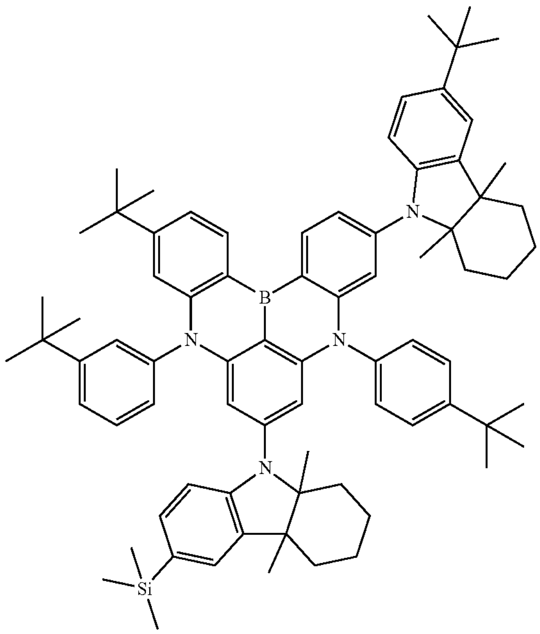
-continued
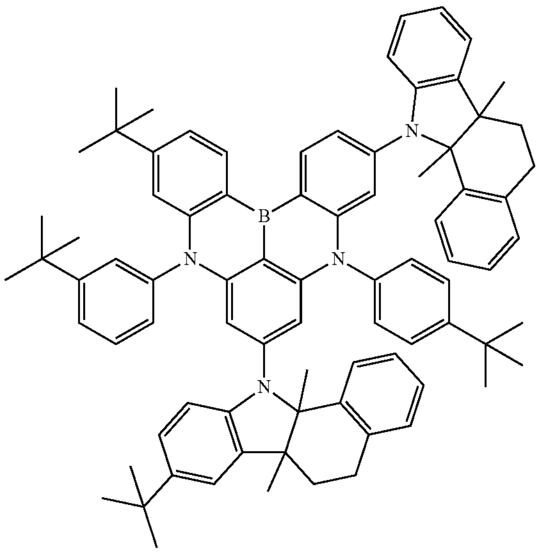
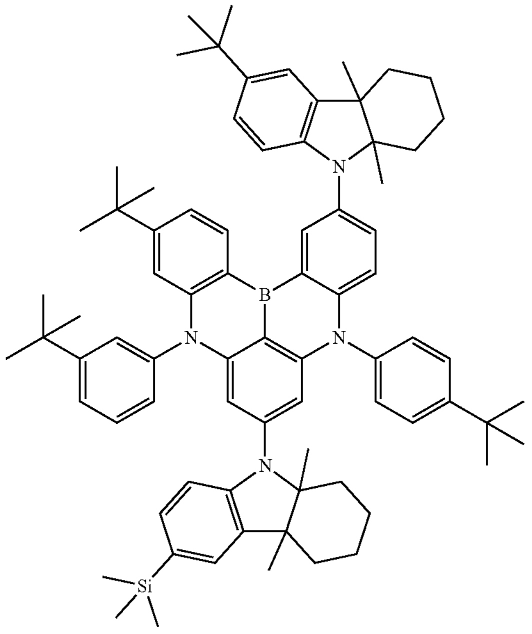

-continued
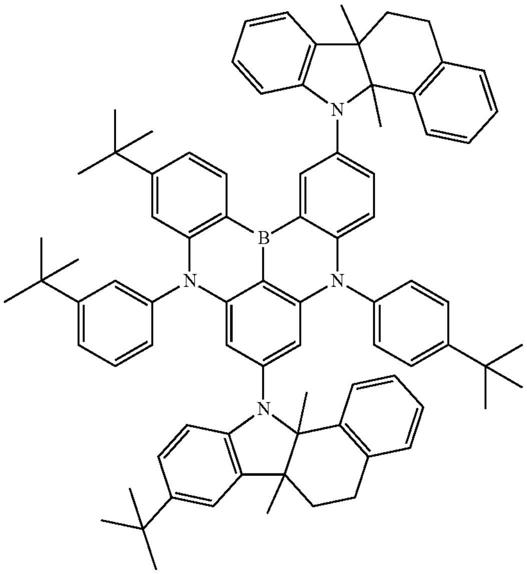
-continued
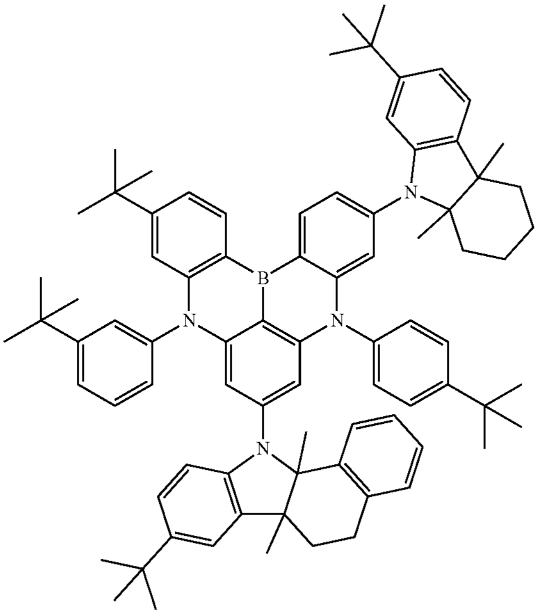
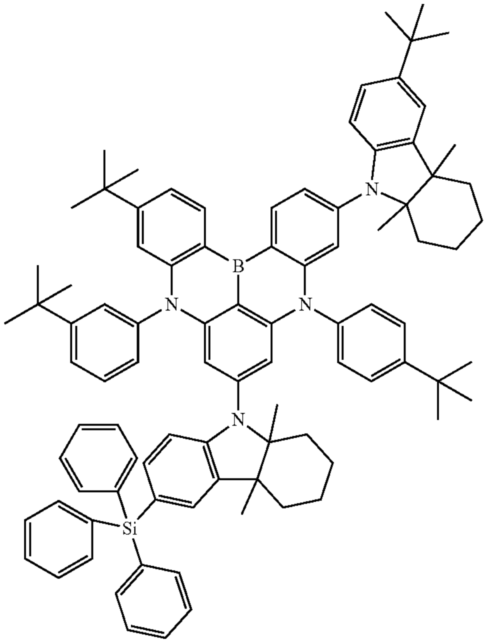
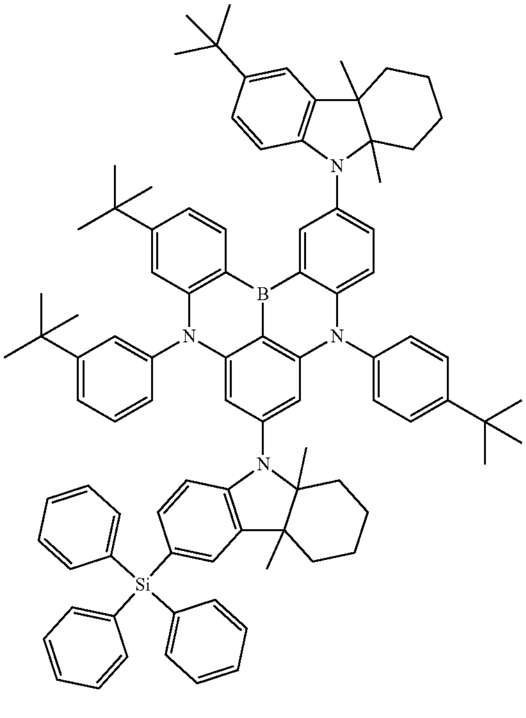

-continued
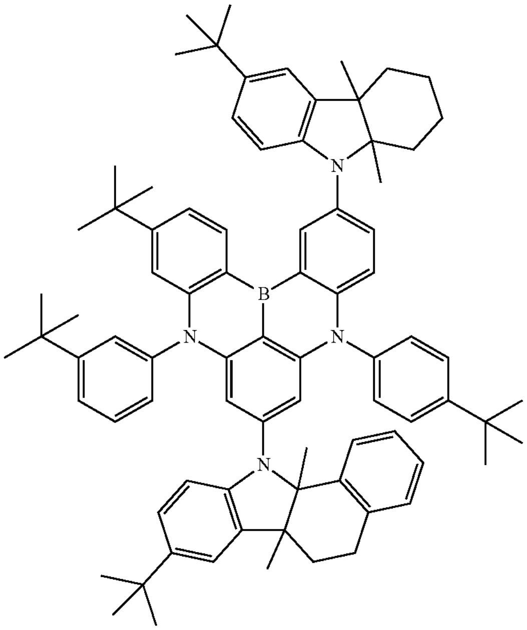
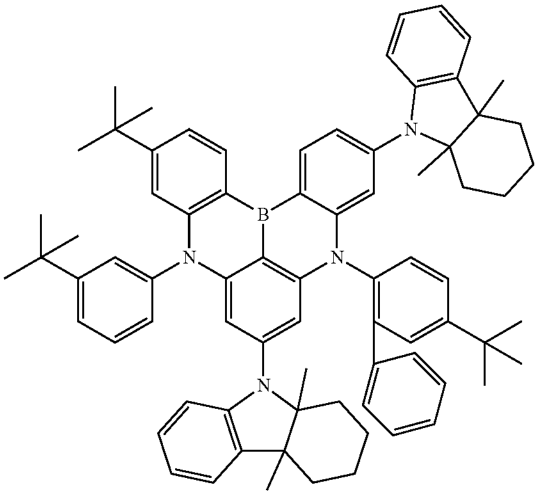
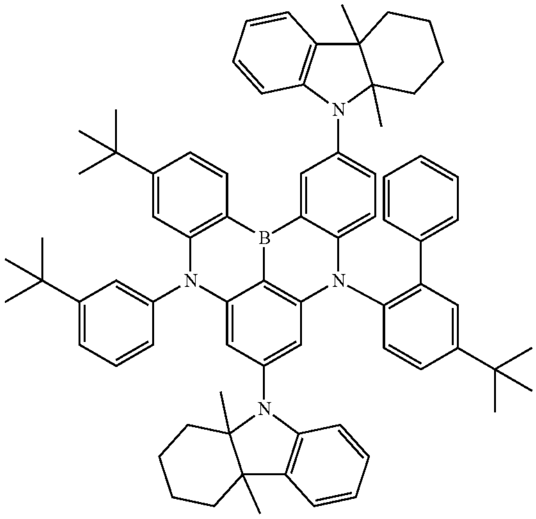
-continued
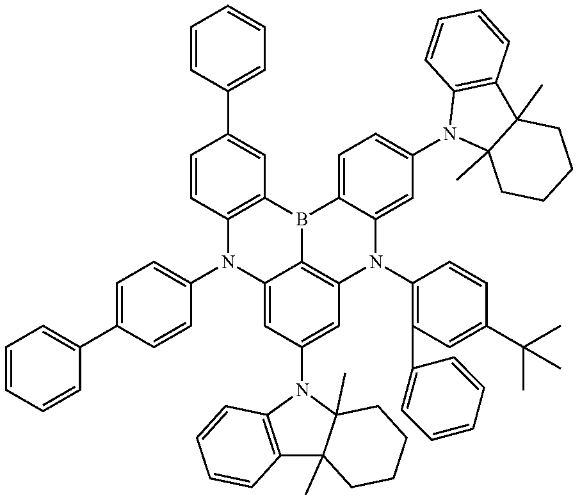
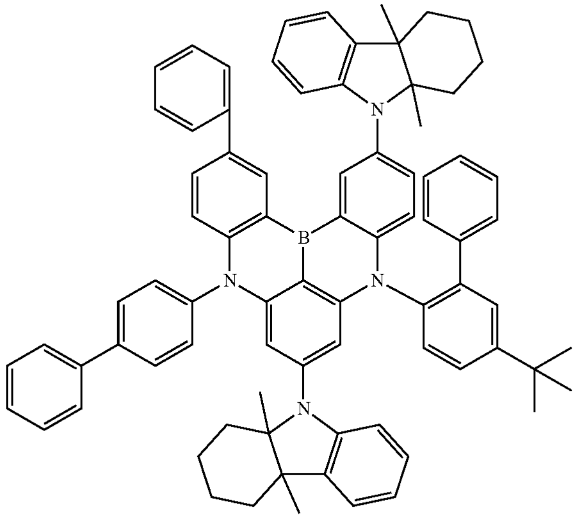
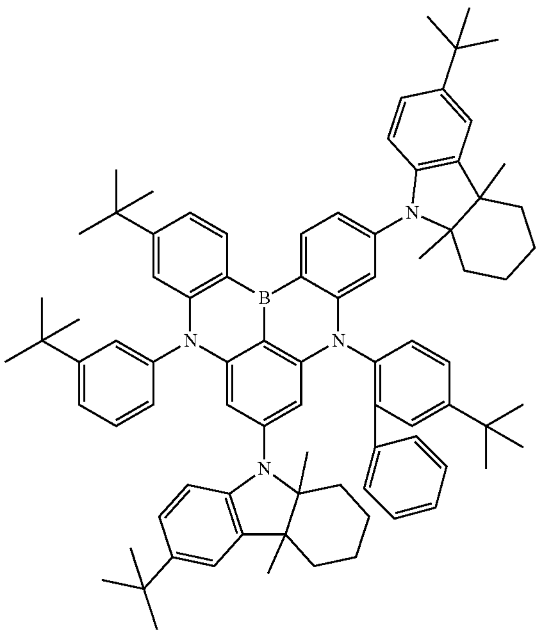

-continued
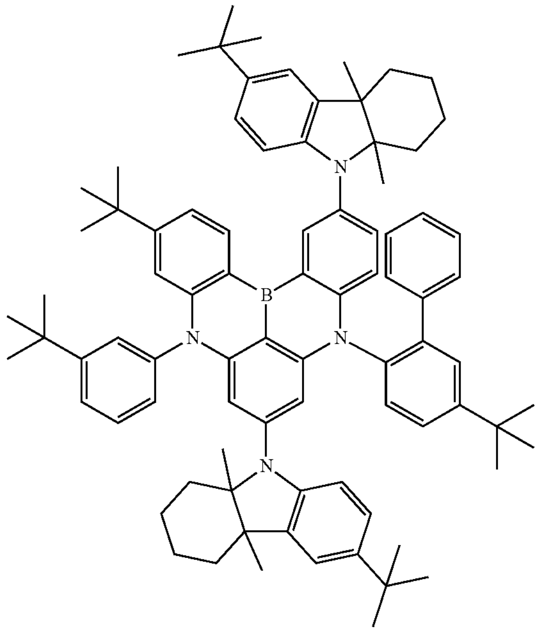
-continued
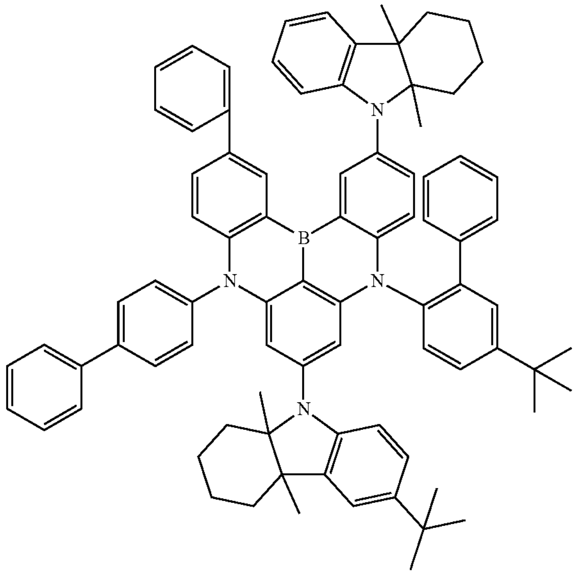
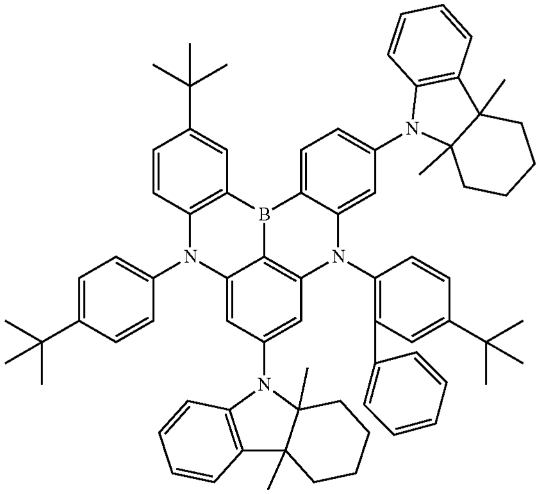
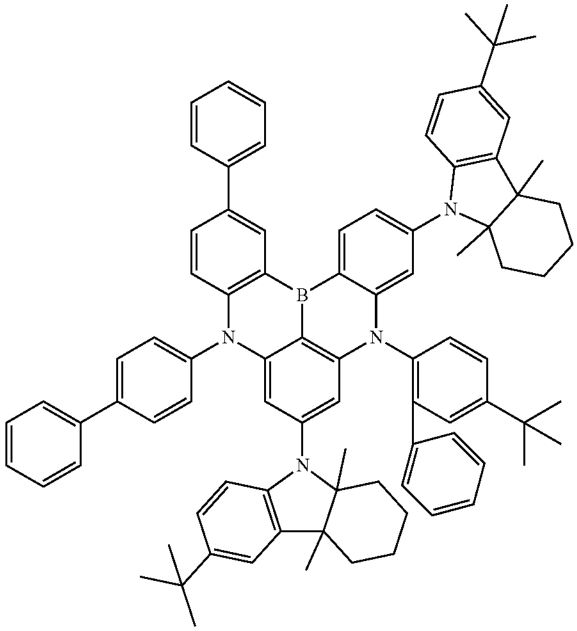
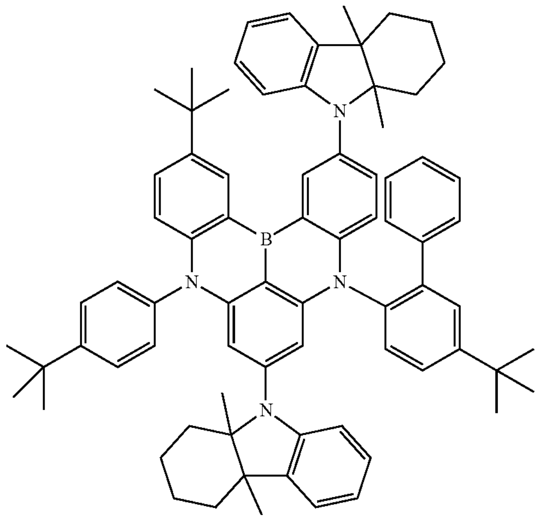

-continued
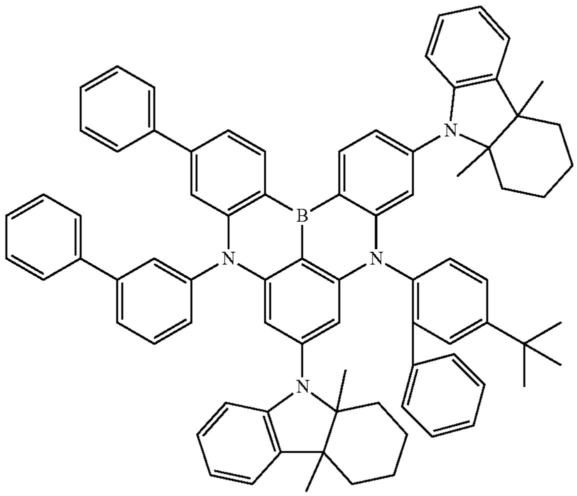
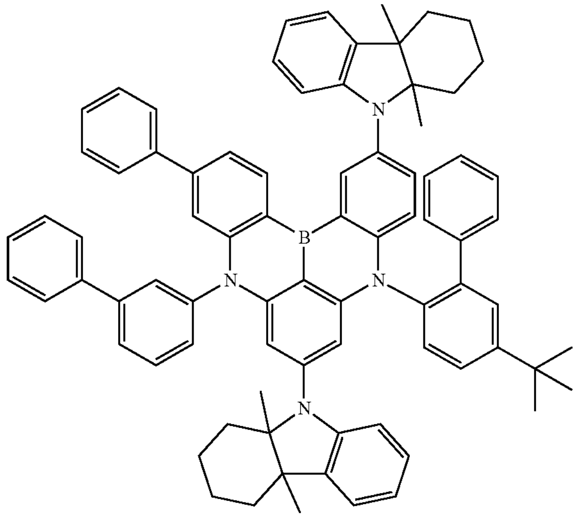
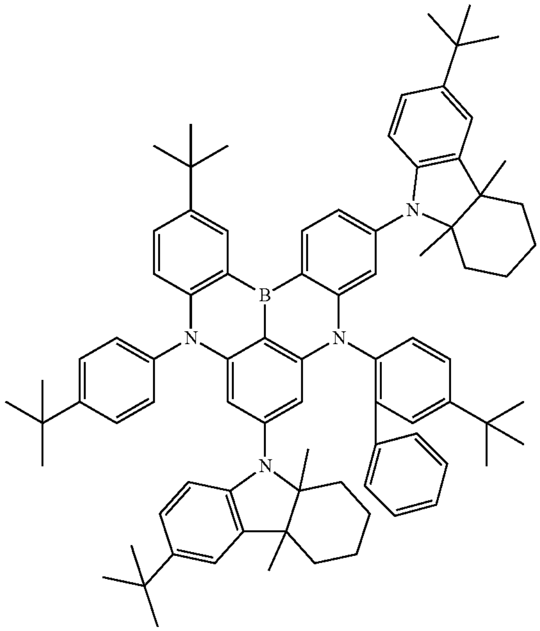
-continued
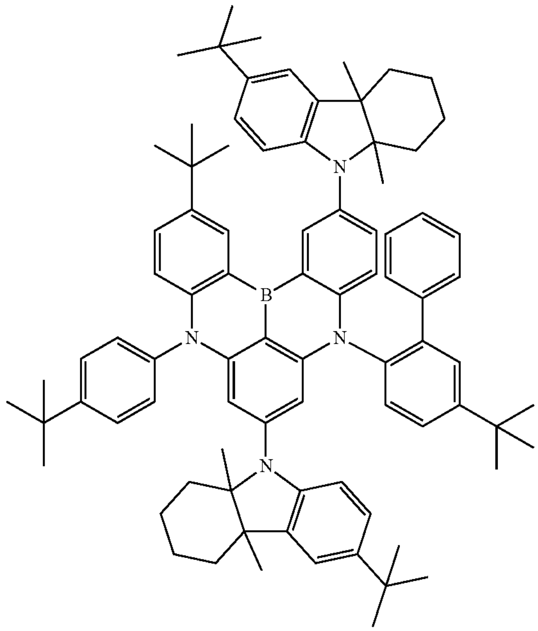
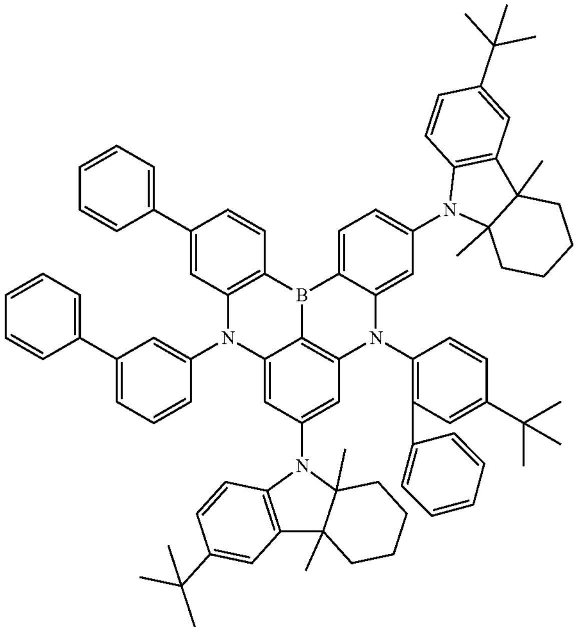

-continued
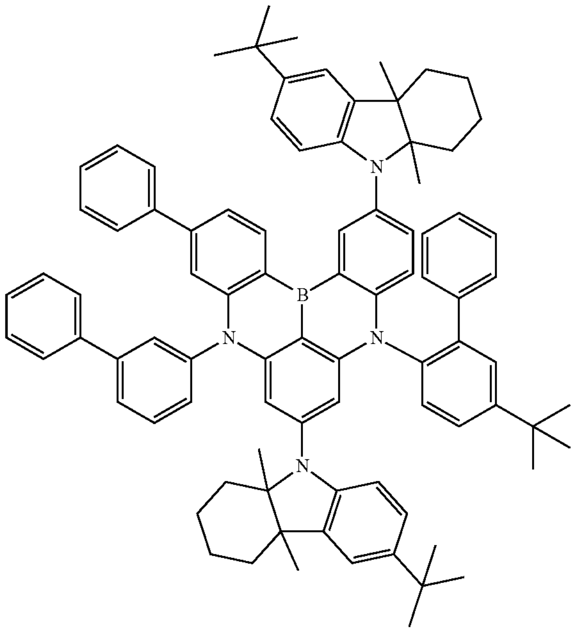
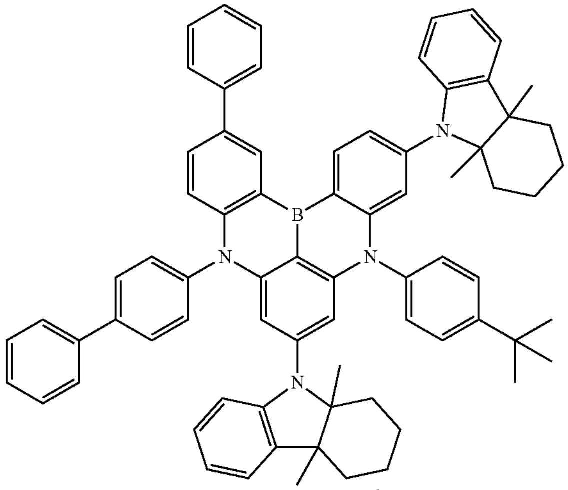
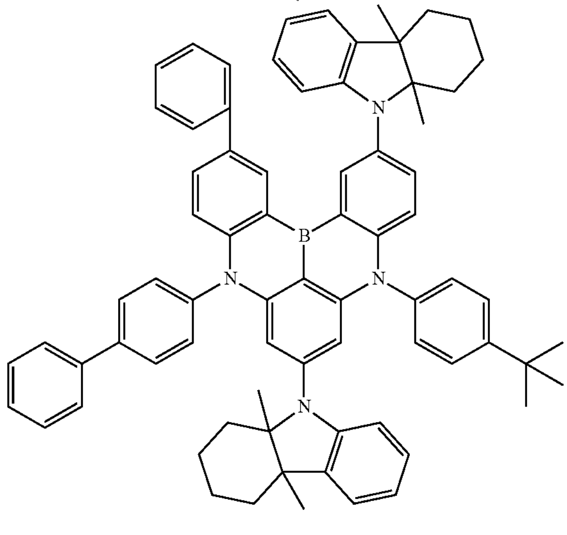
-continued
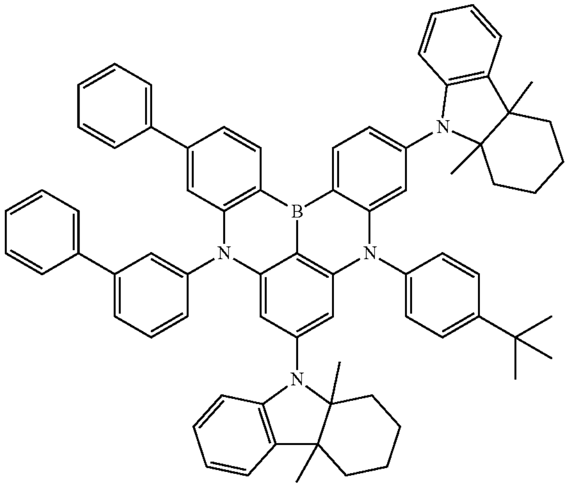
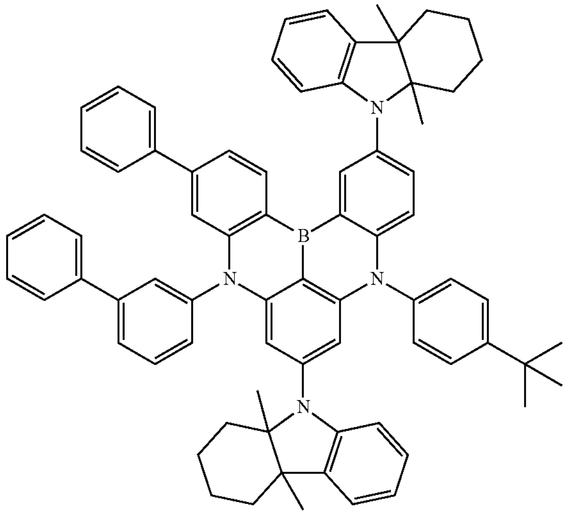
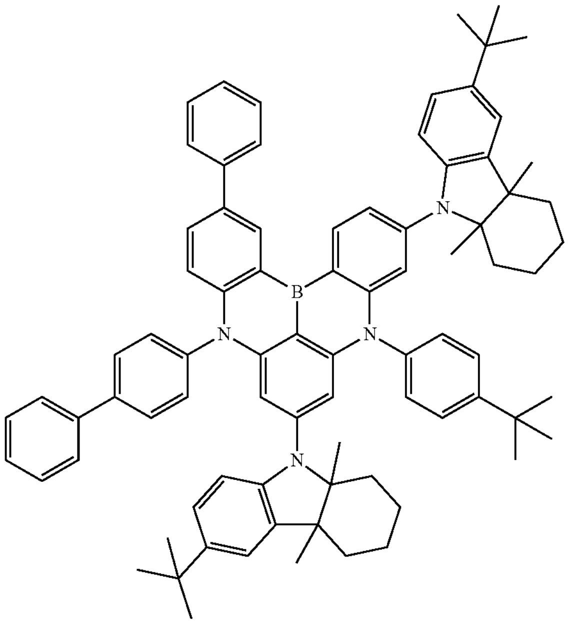

-continued
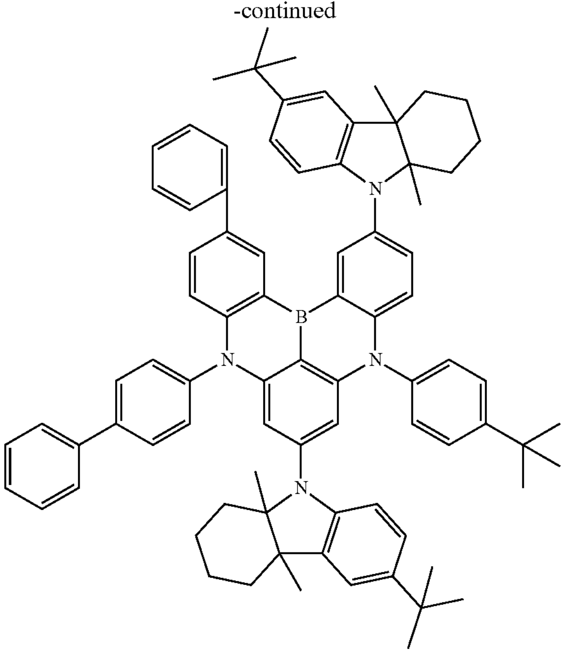
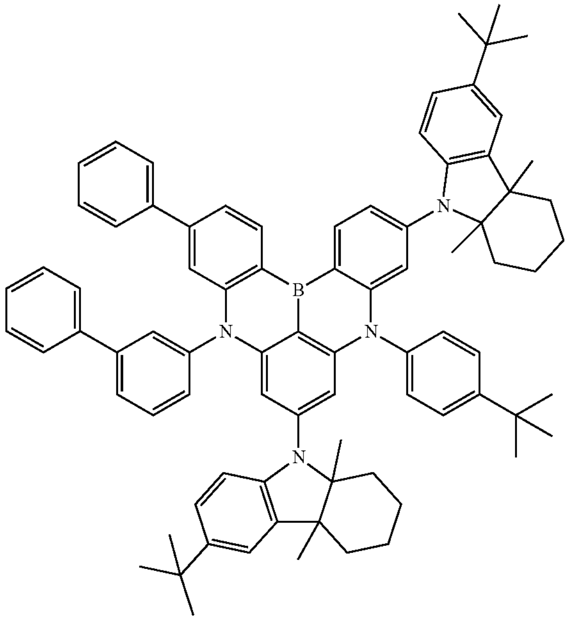
-continued
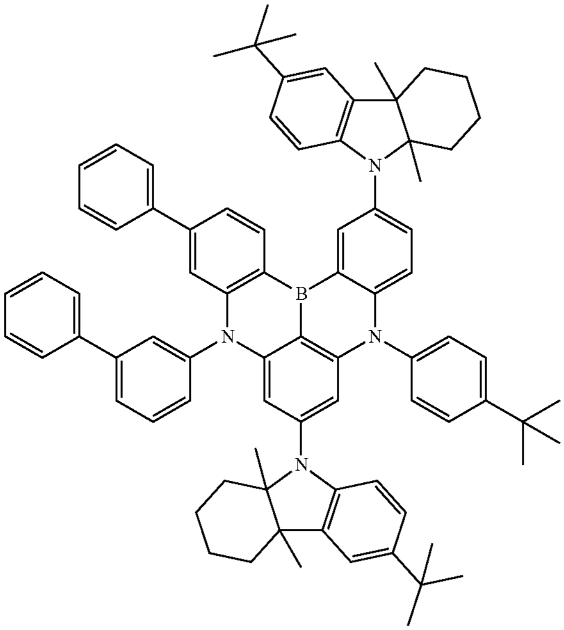
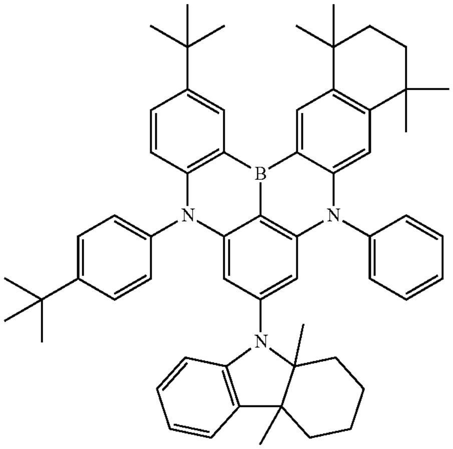
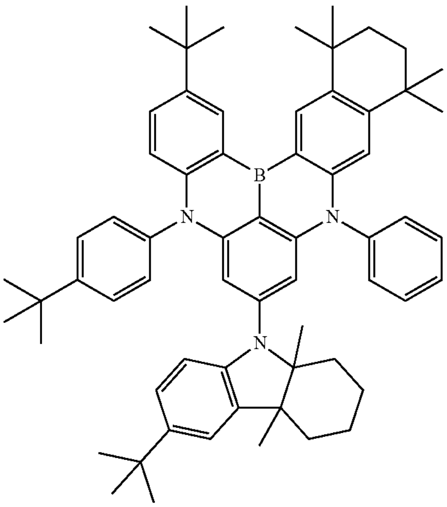

-continued
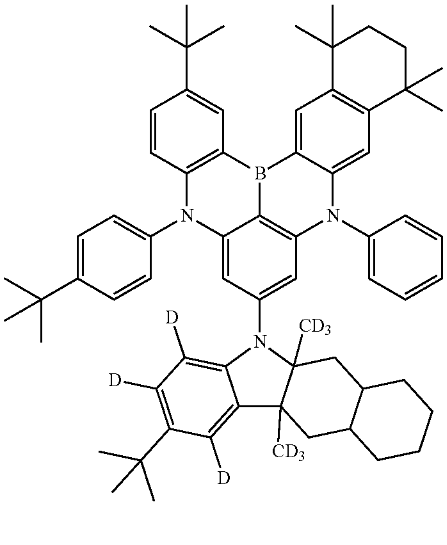
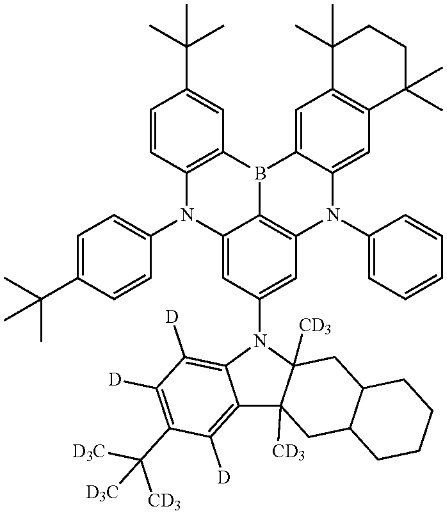
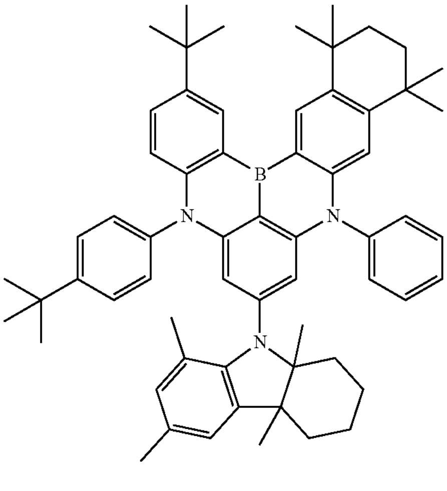
-continued
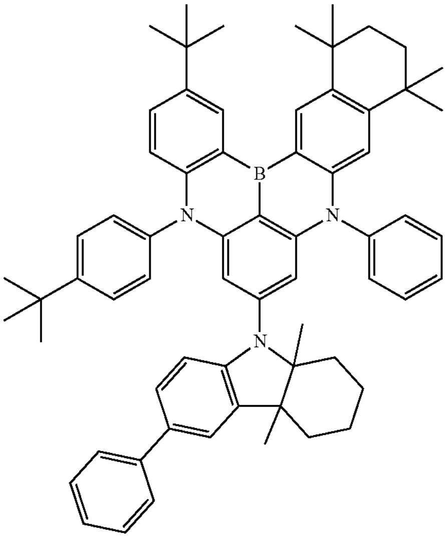
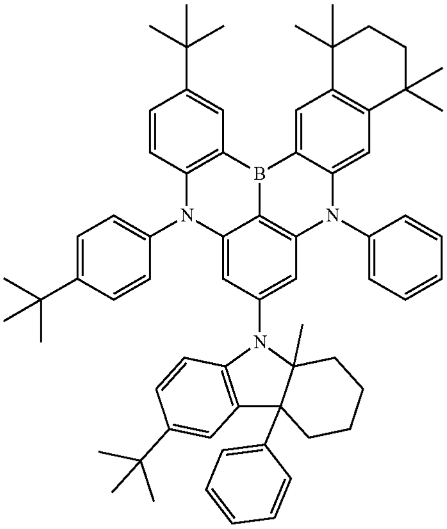
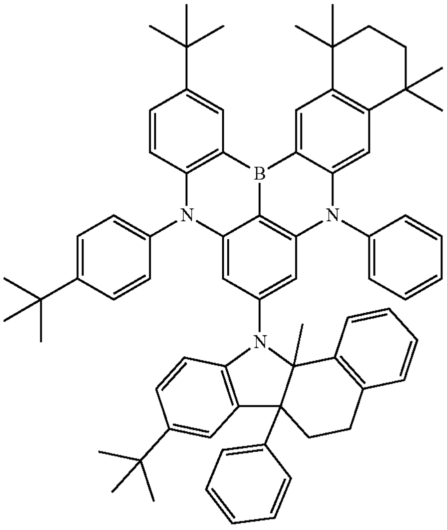

-continued
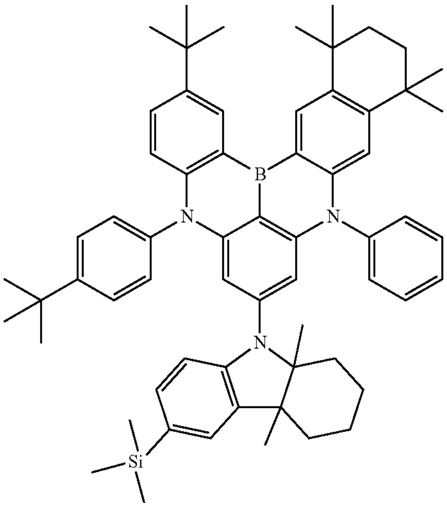
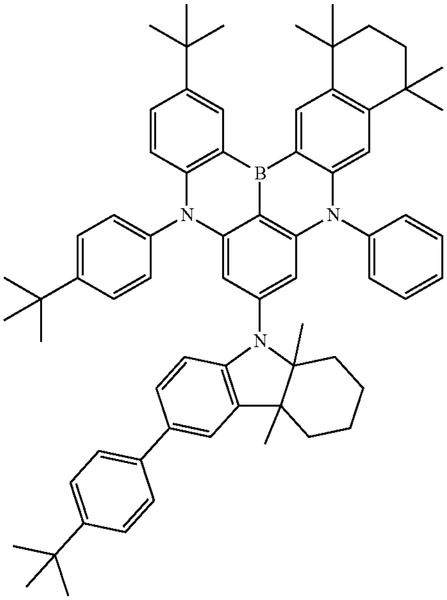
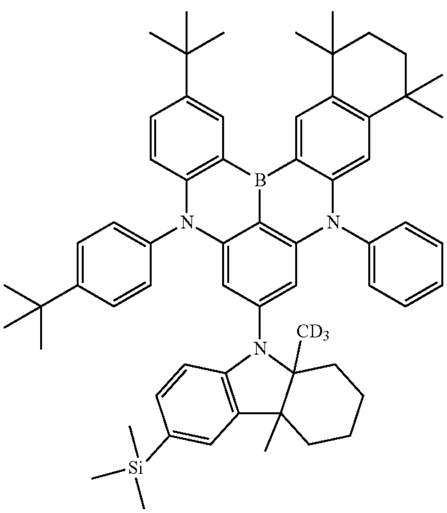
-continued
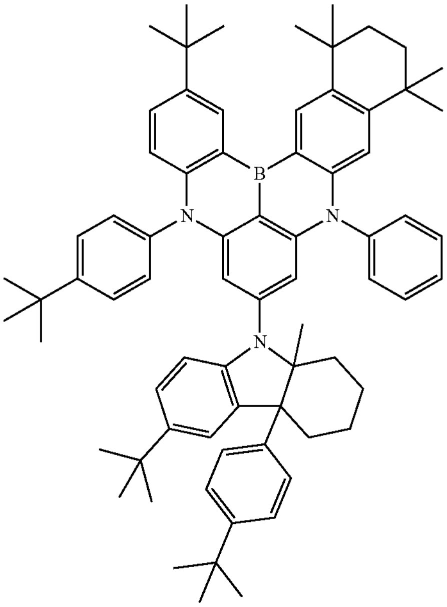
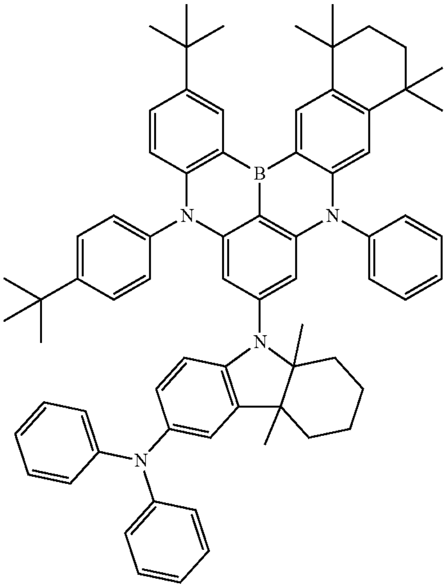
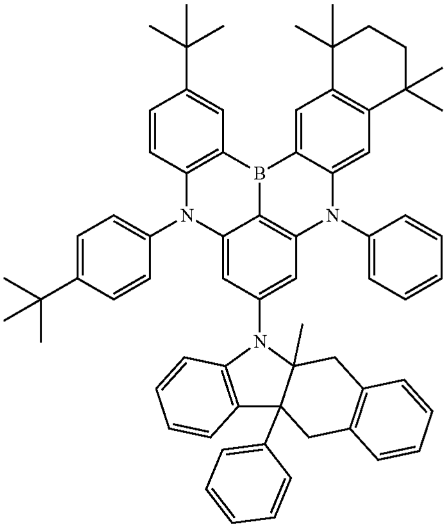

-continued
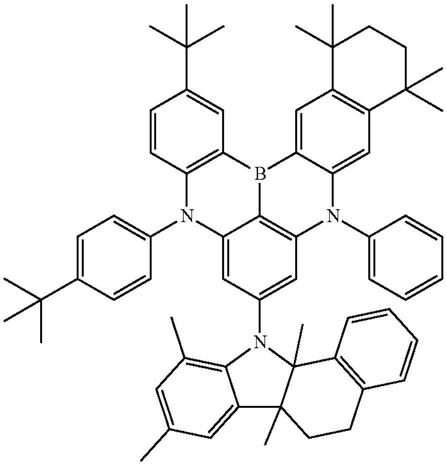
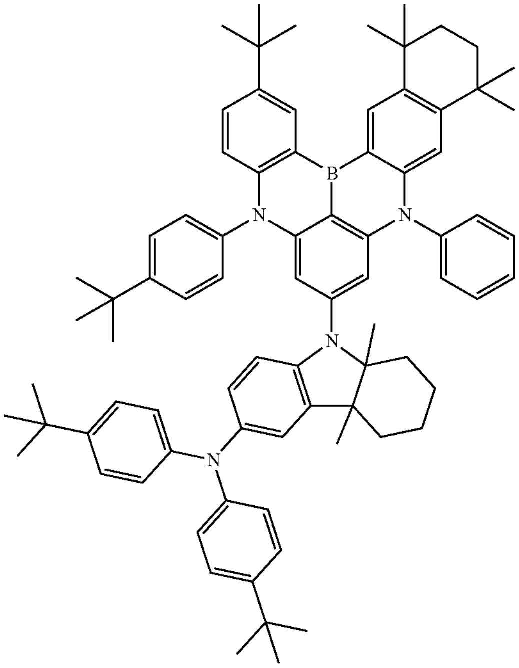
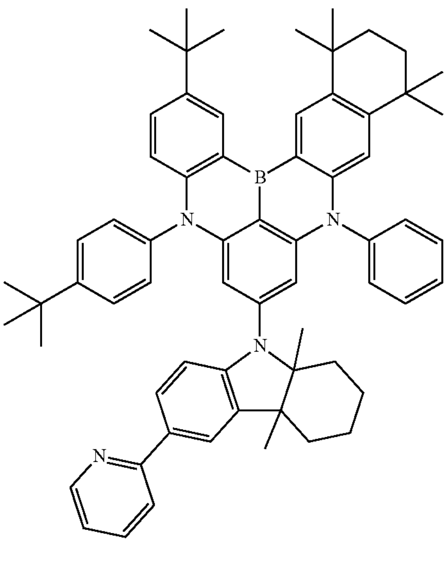
-continued
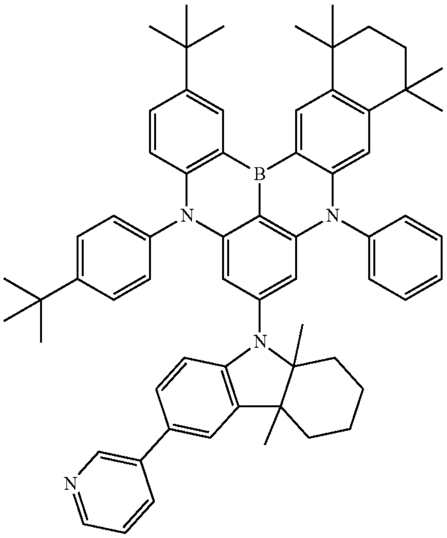
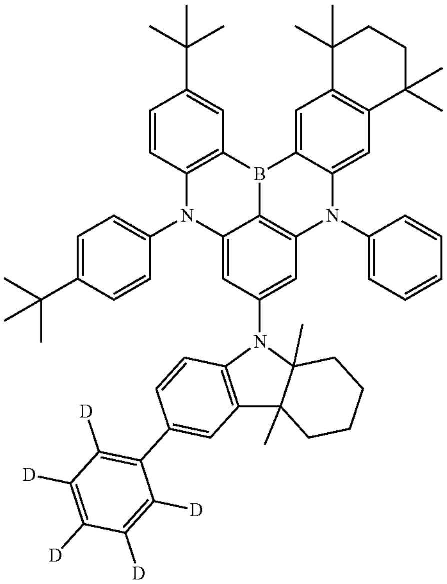
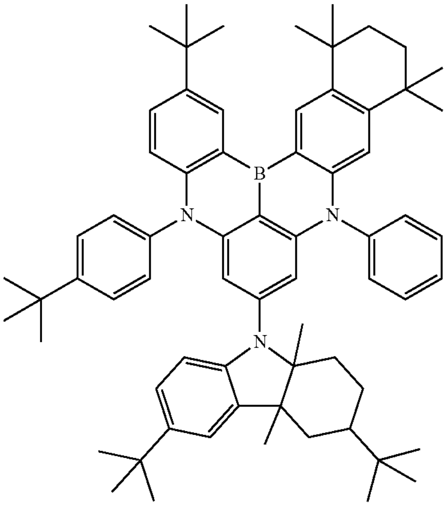

-continued
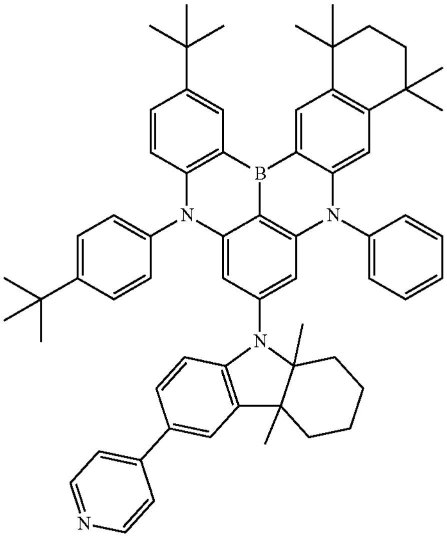
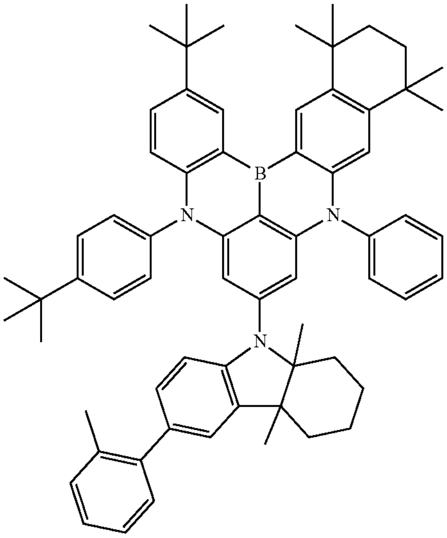
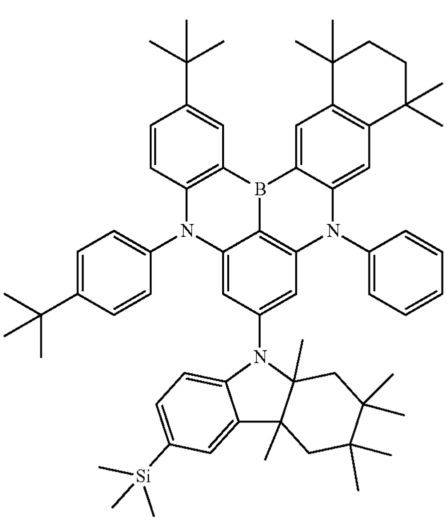
-continued
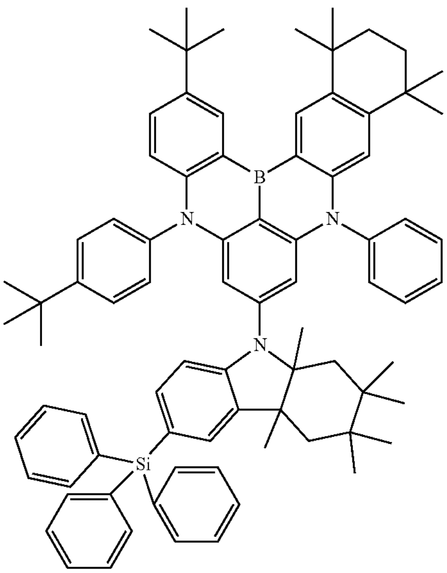
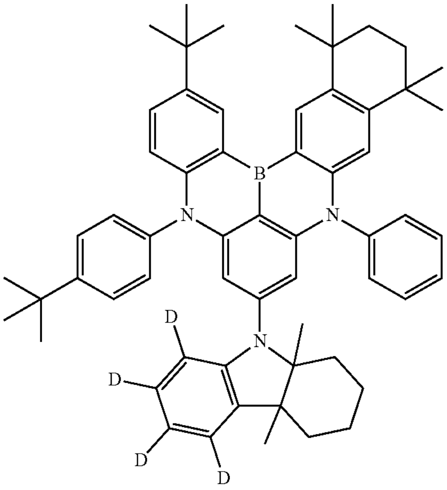
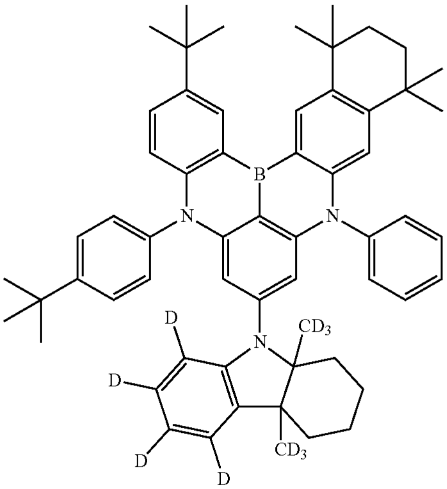

-continued
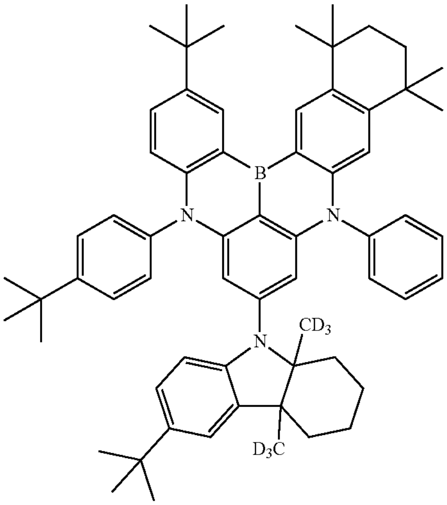
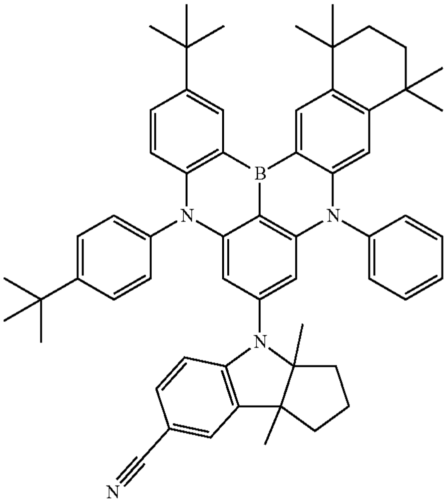
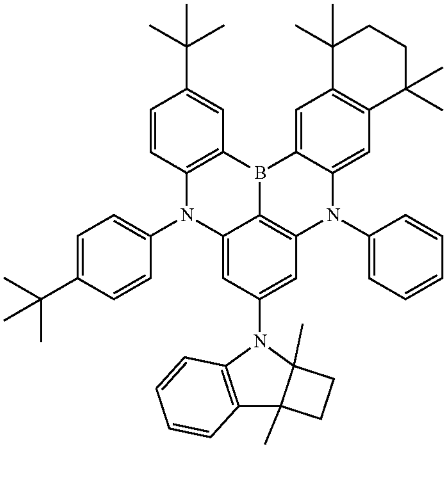
-continued
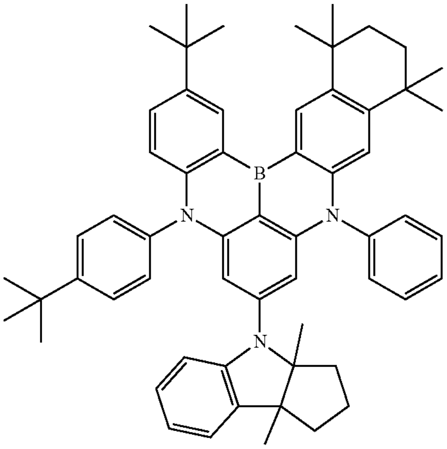
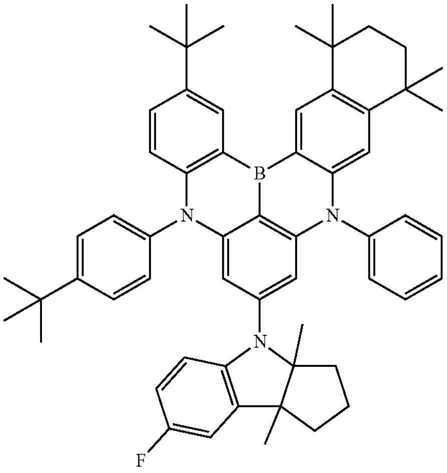
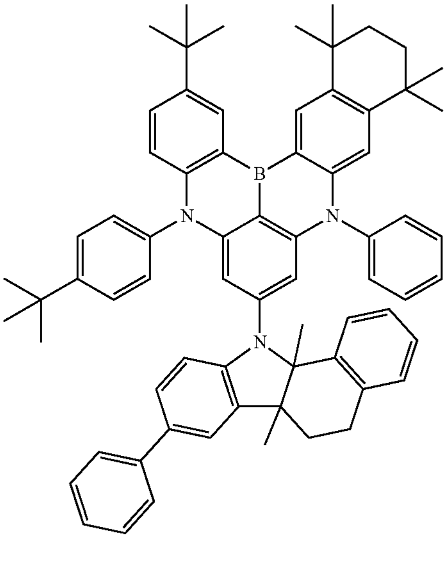

-continued
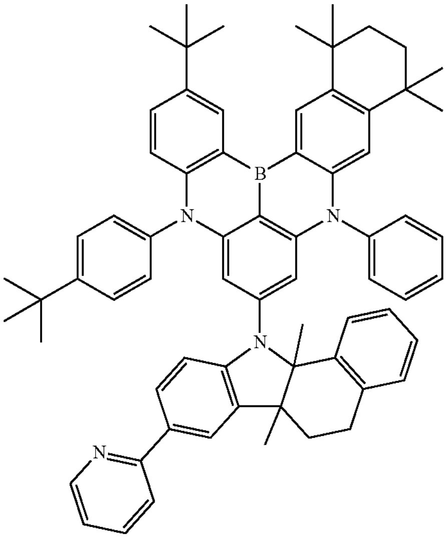
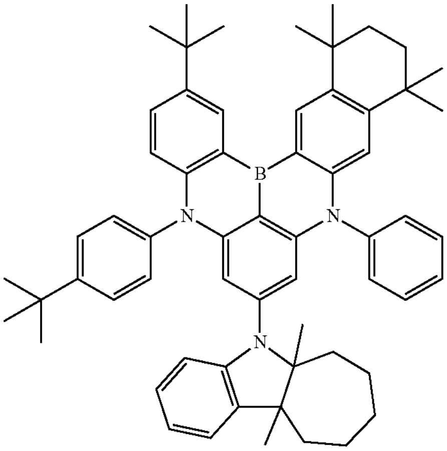
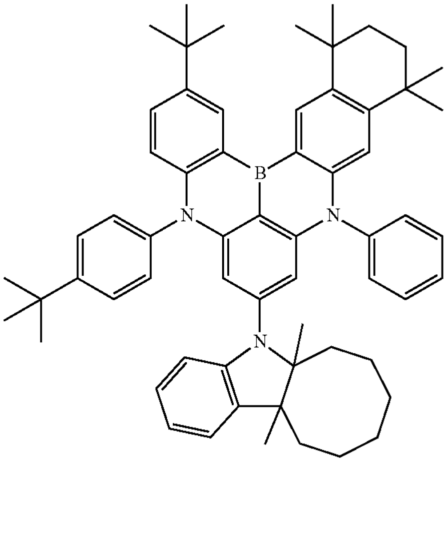
-continued
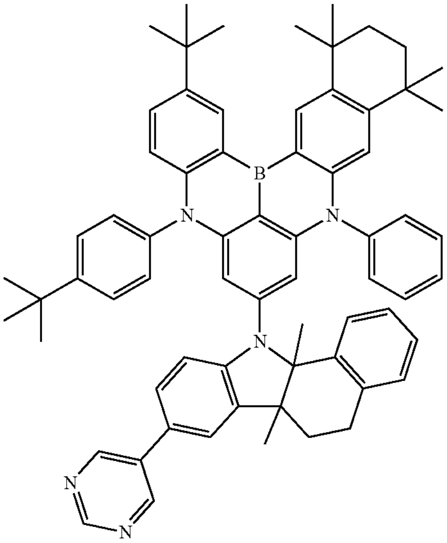
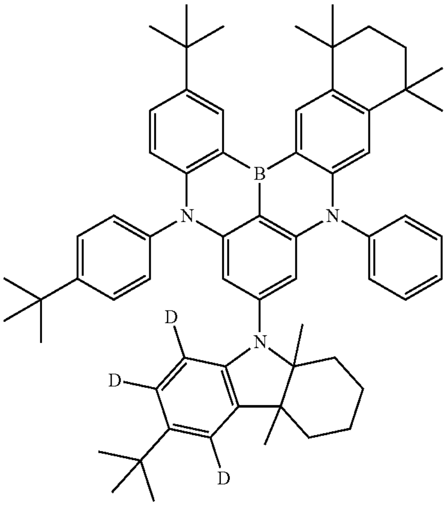
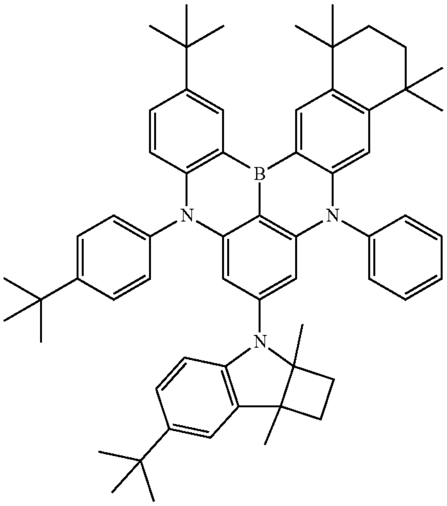

-continued
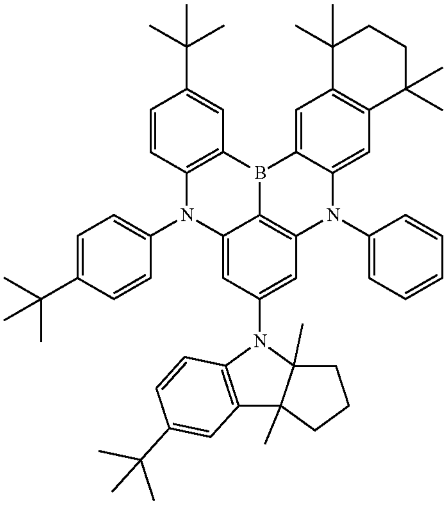
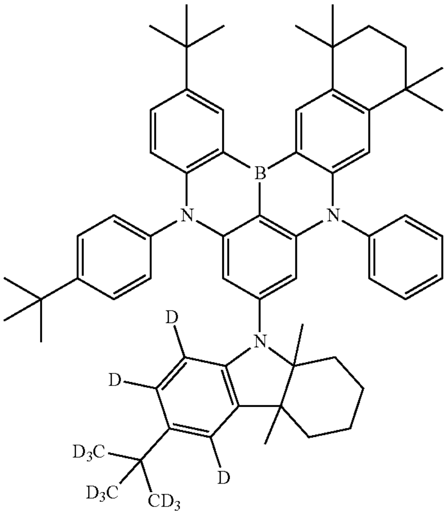
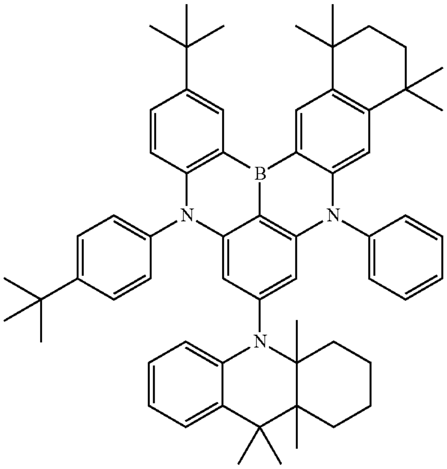
-continued
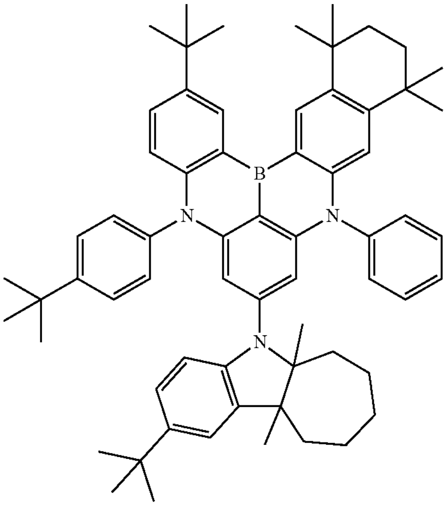
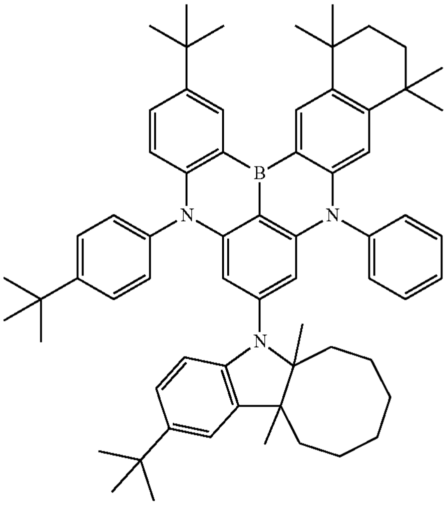
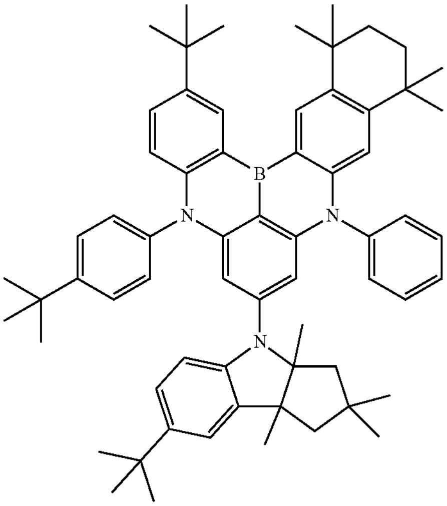

-continued
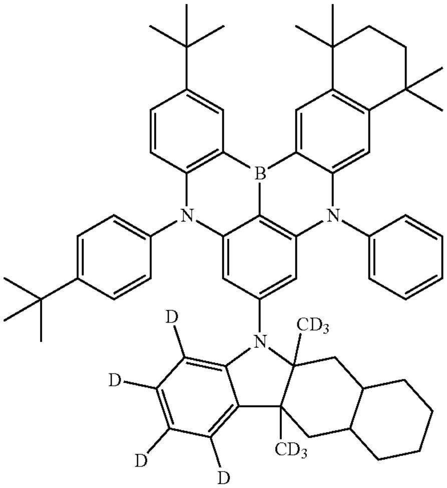
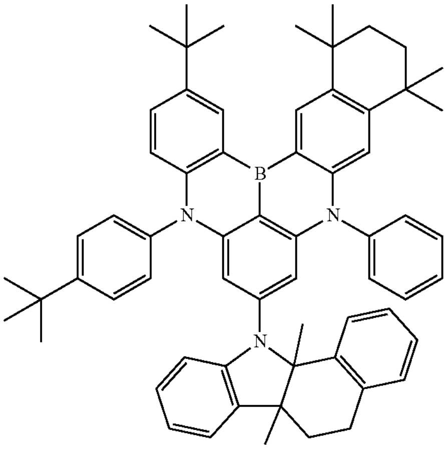
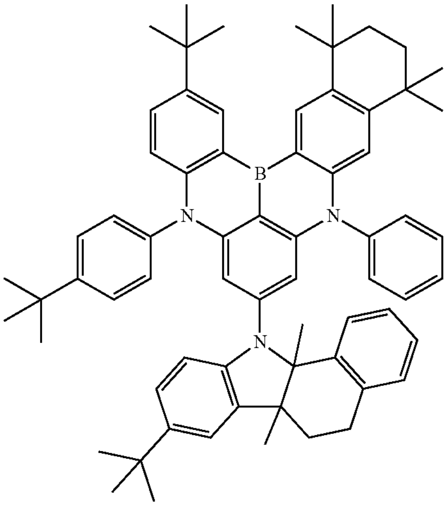
-continued
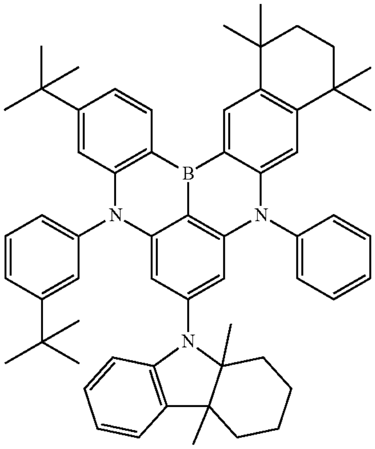
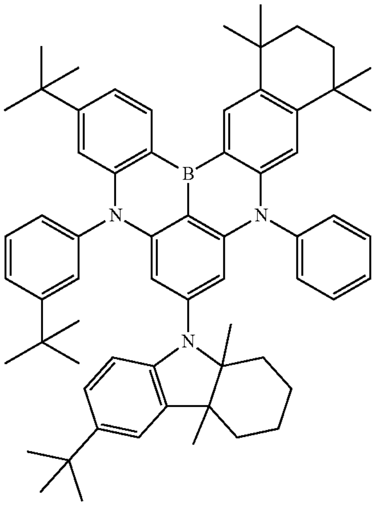
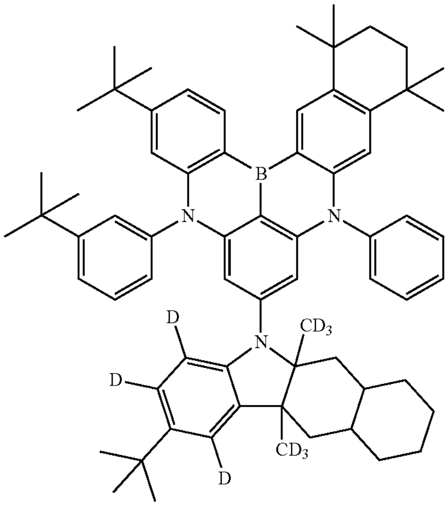

-continued
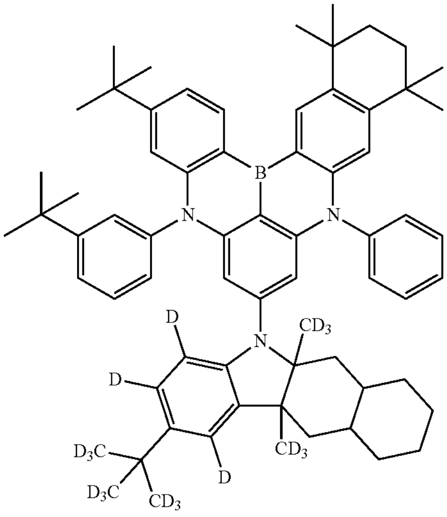
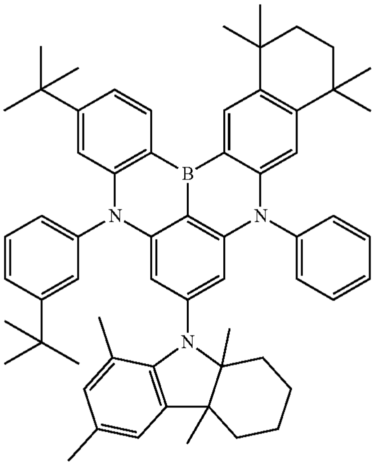
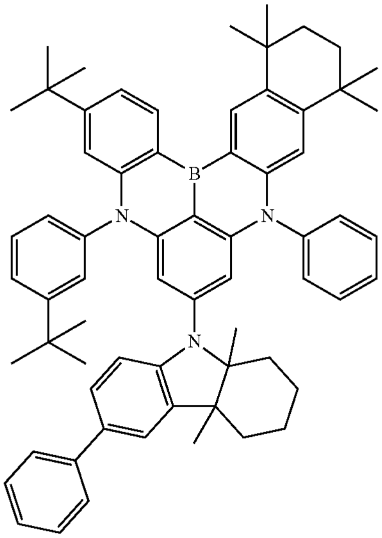
-continued
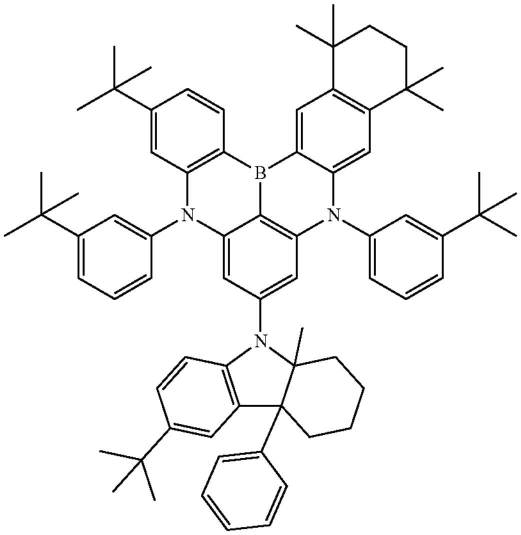
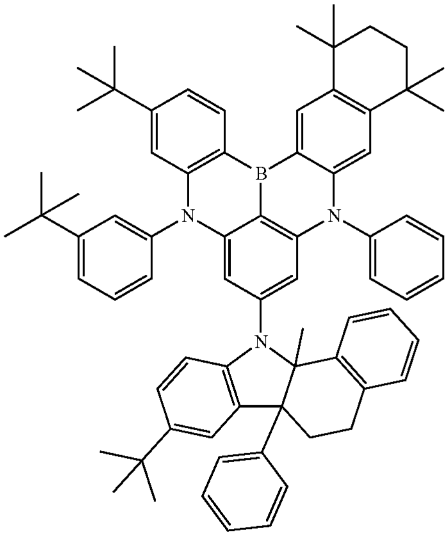
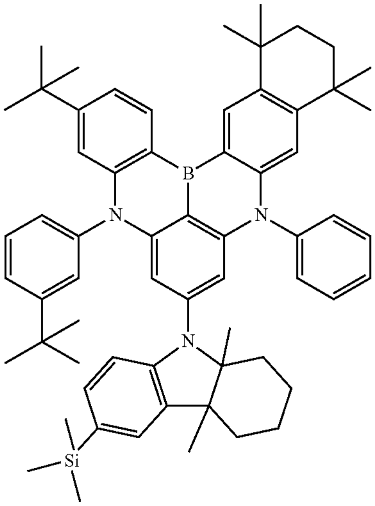

-continued
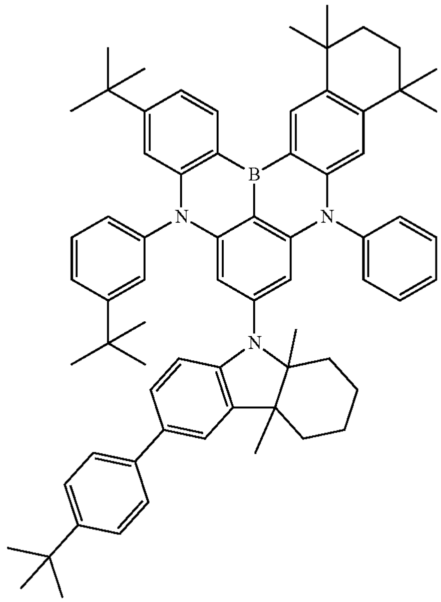
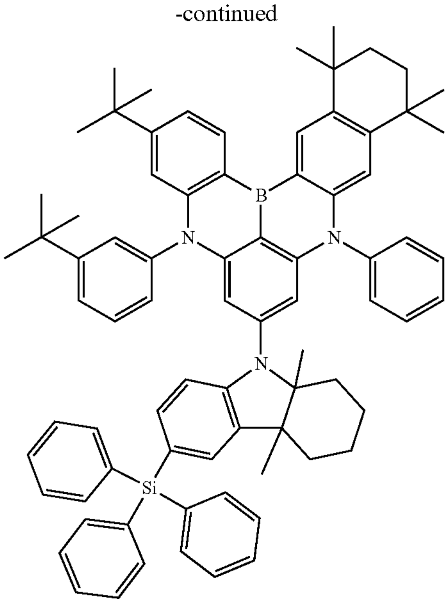
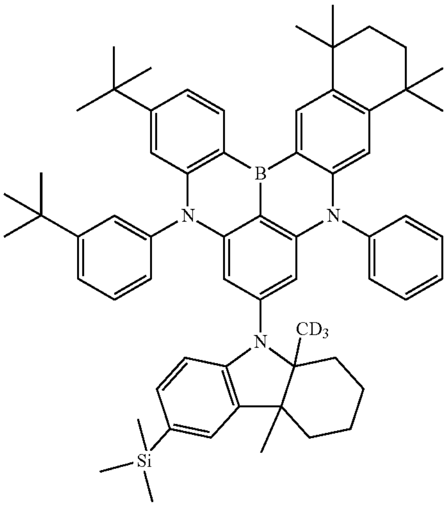
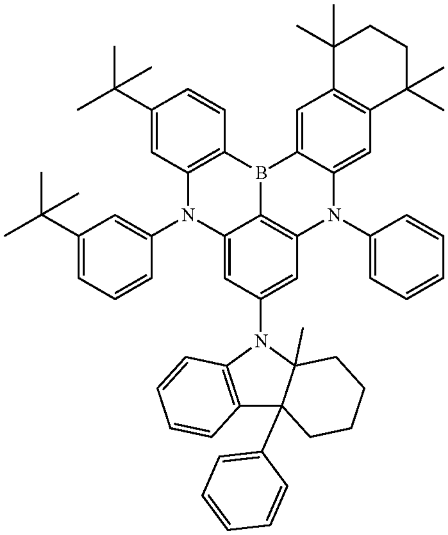
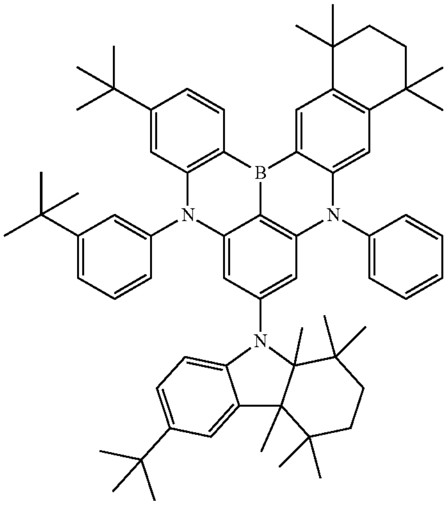
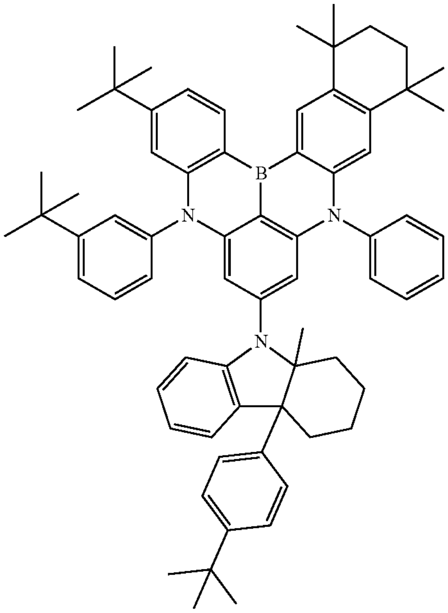
-continued -continued
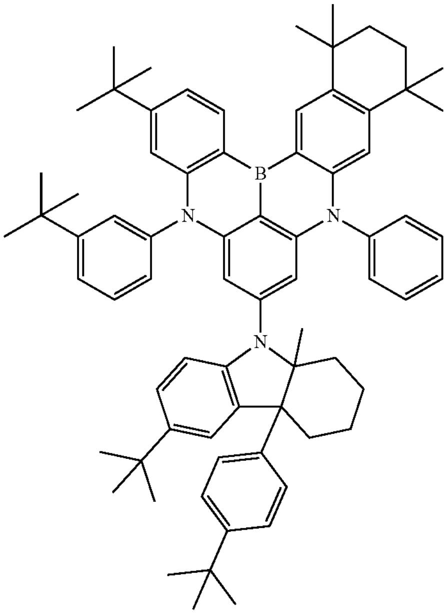
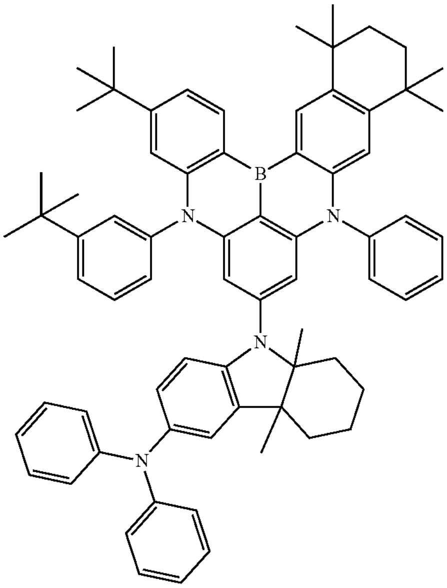
-continued
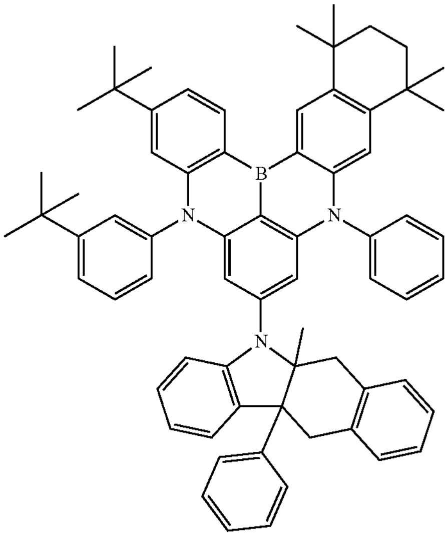
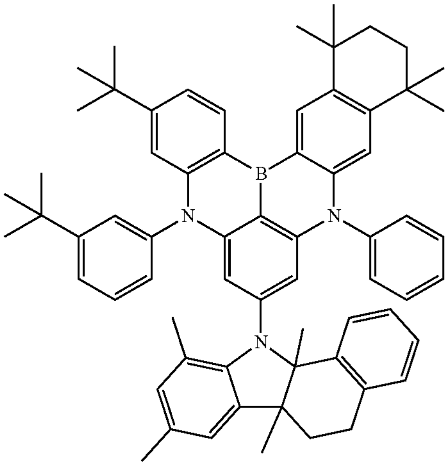
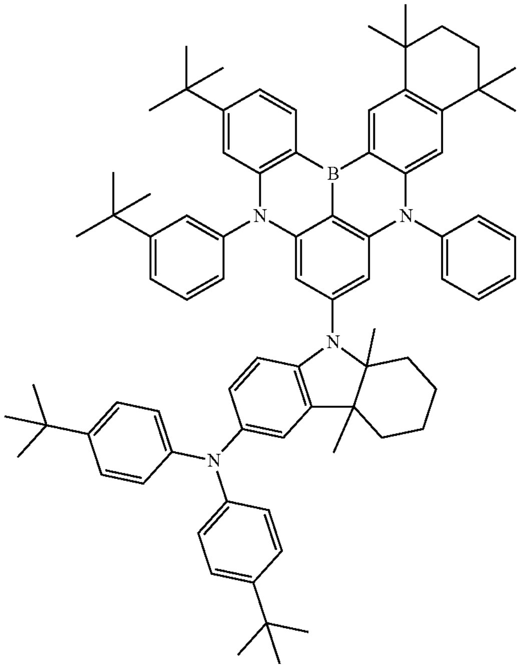

-continued
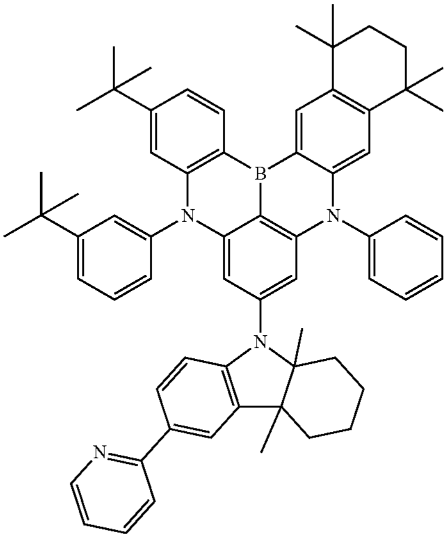
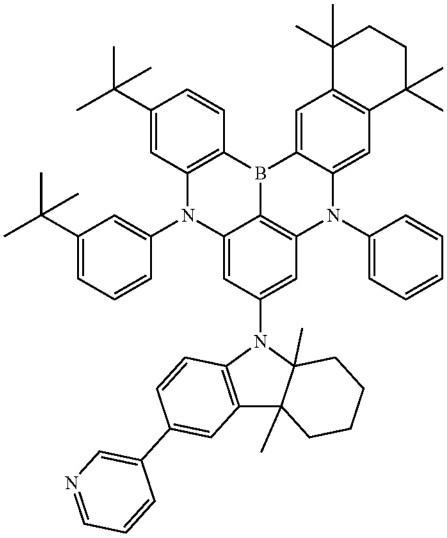
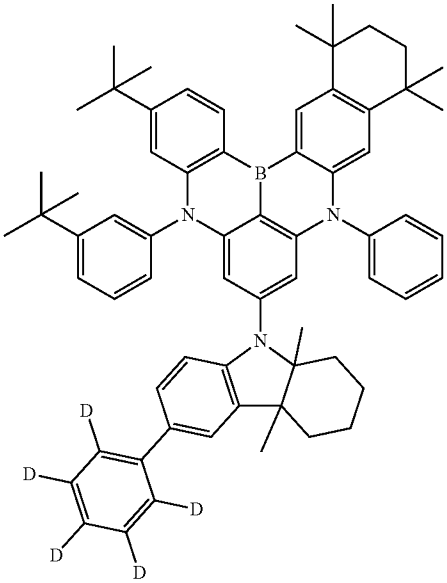
-continued
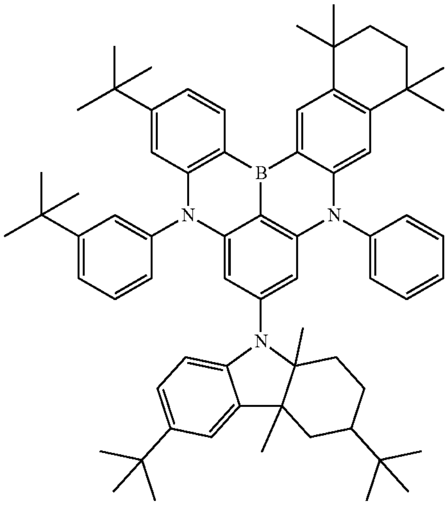
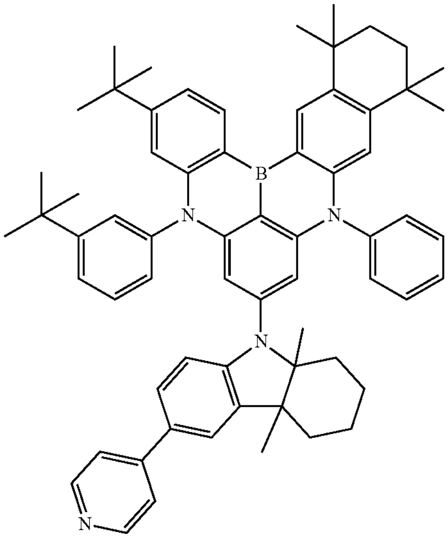
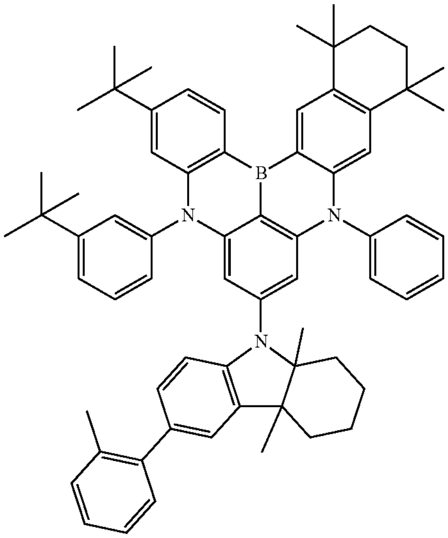

-continued
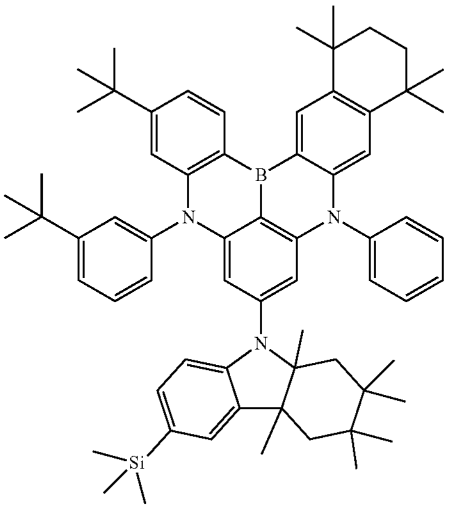
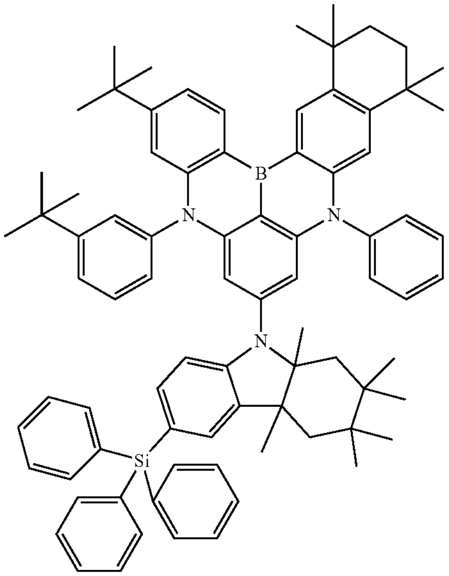
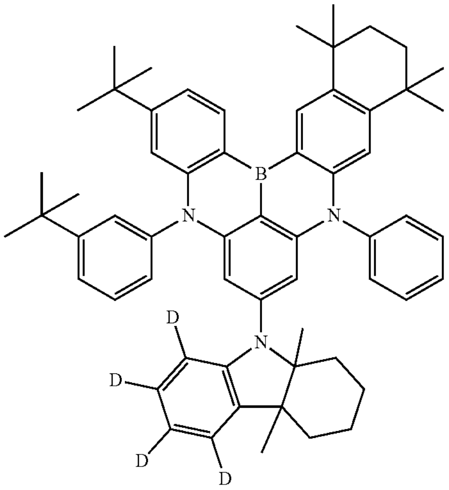
-continued
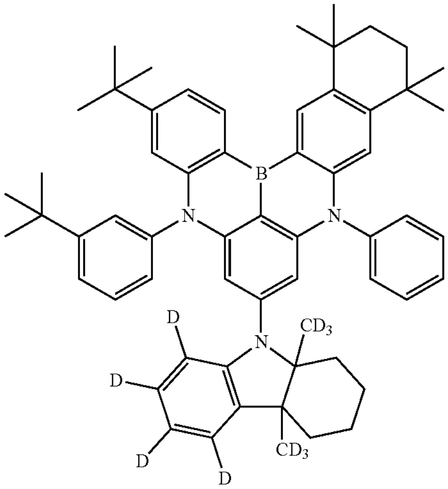
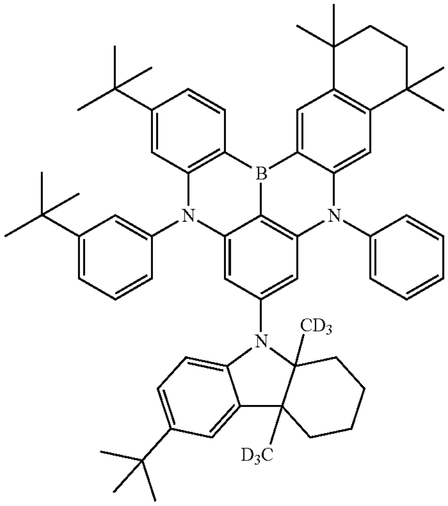
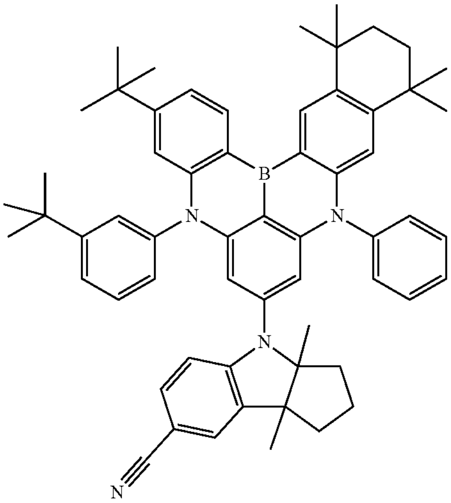

-continued
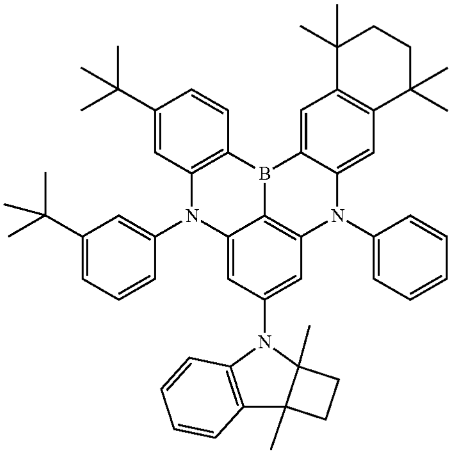
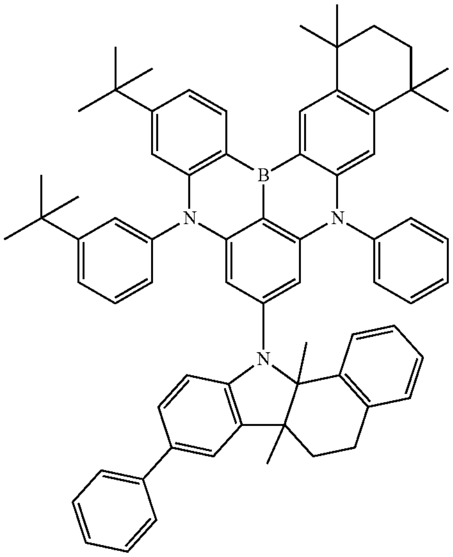
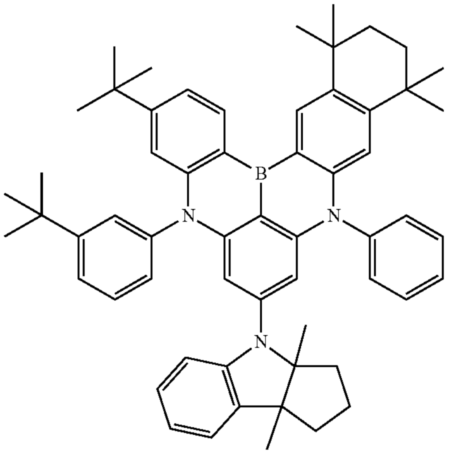
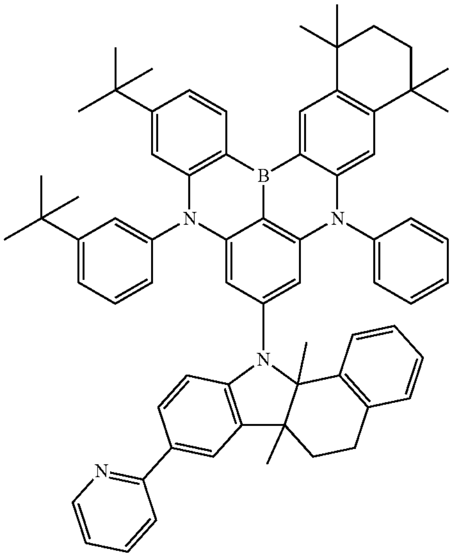
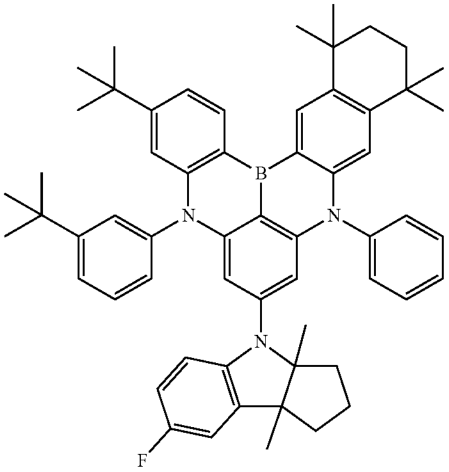
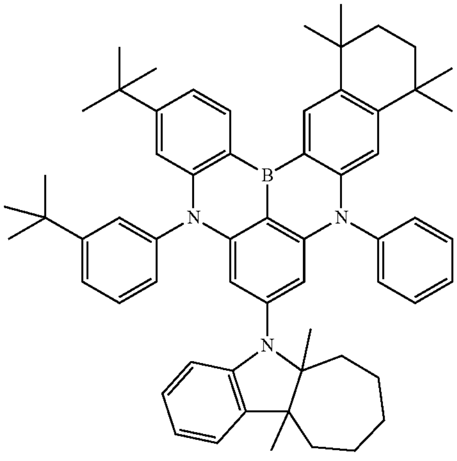

-continued
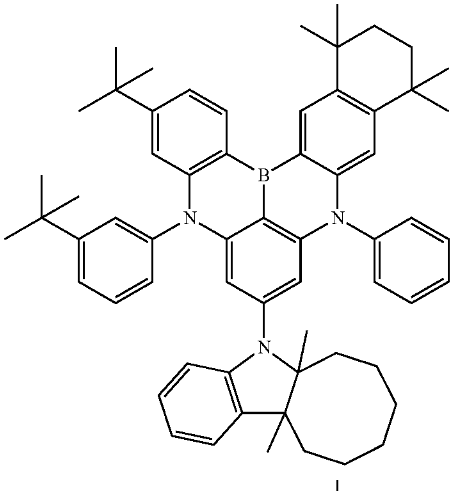
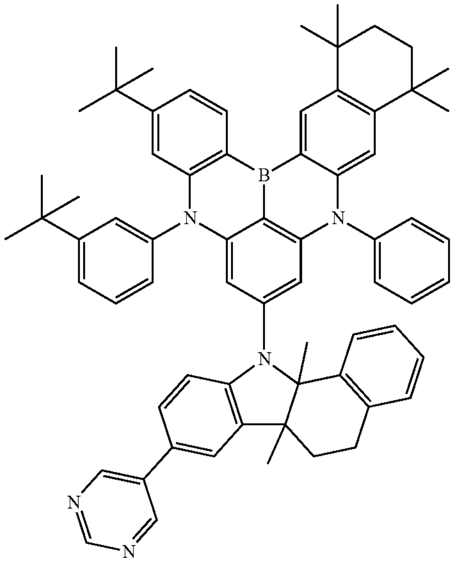
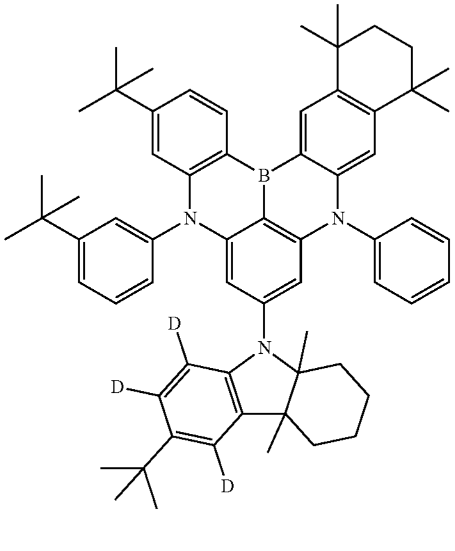
-continued
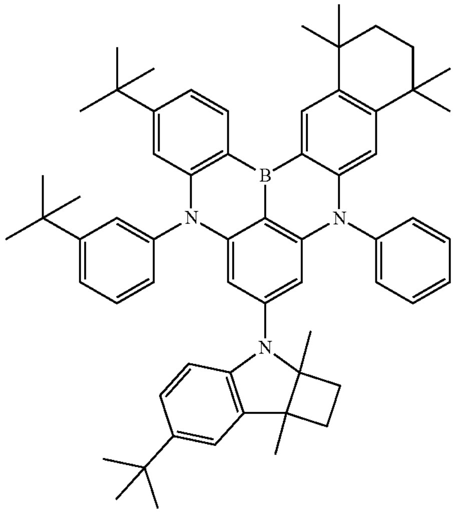
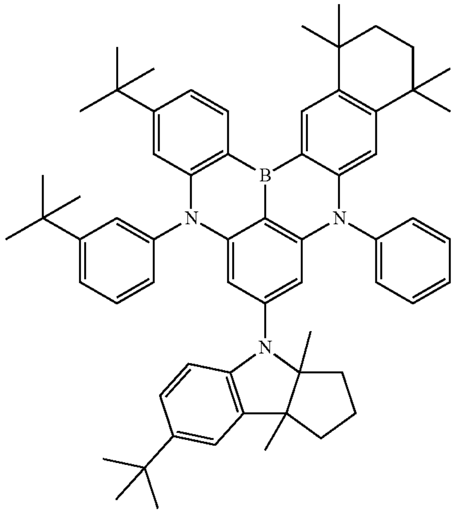
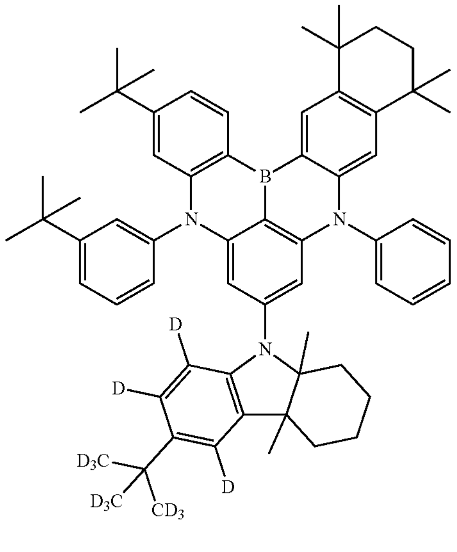

-continued
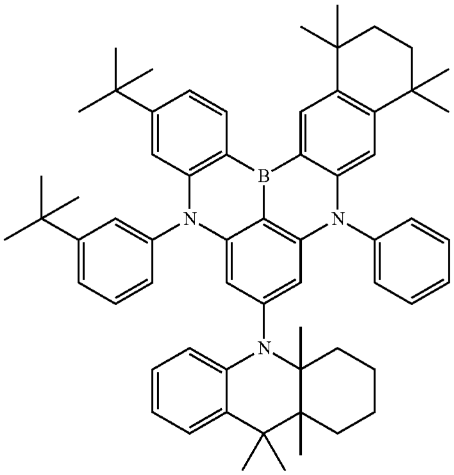
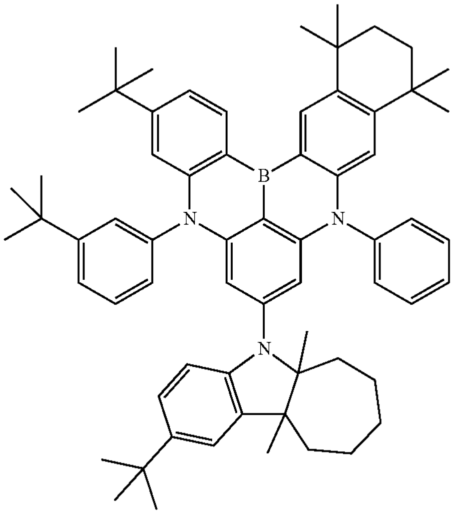
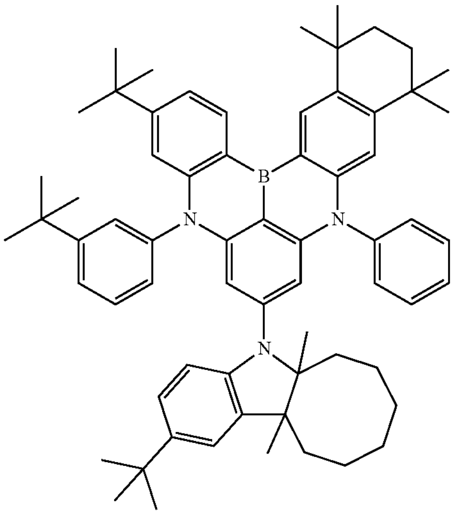
-continued
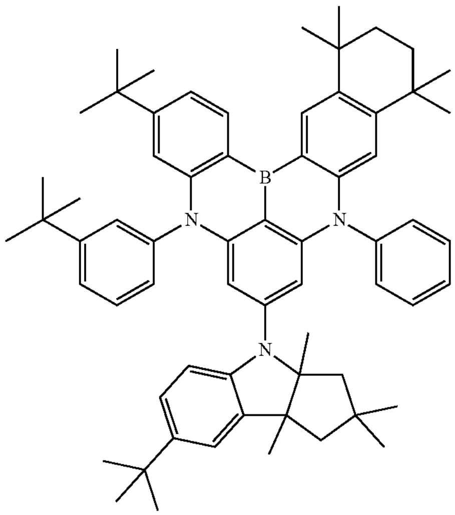
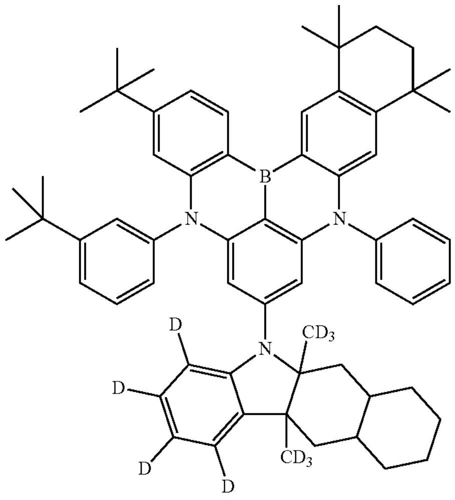
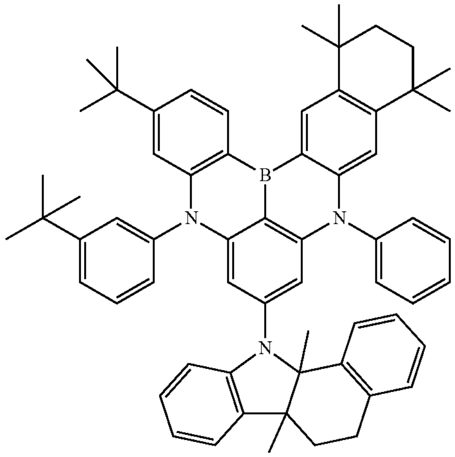

-continued
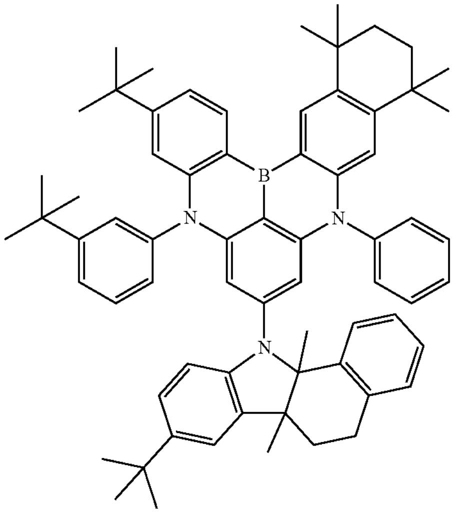
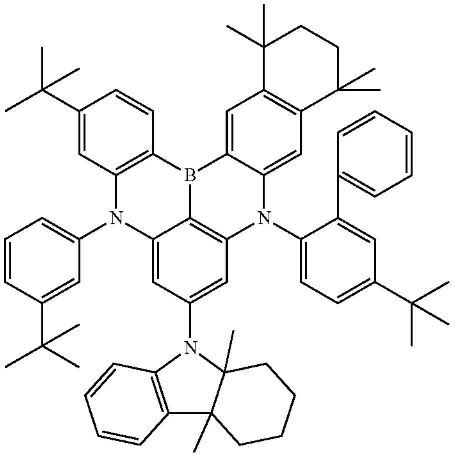
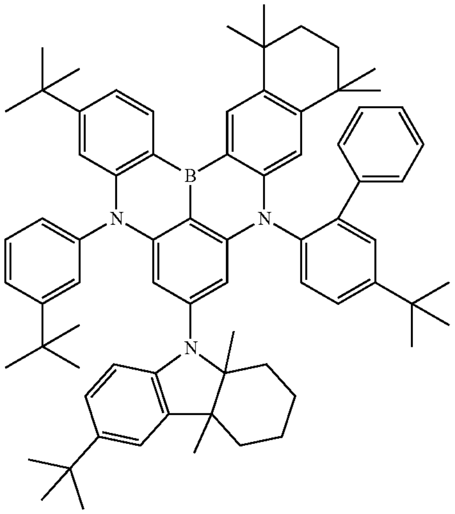
-continued
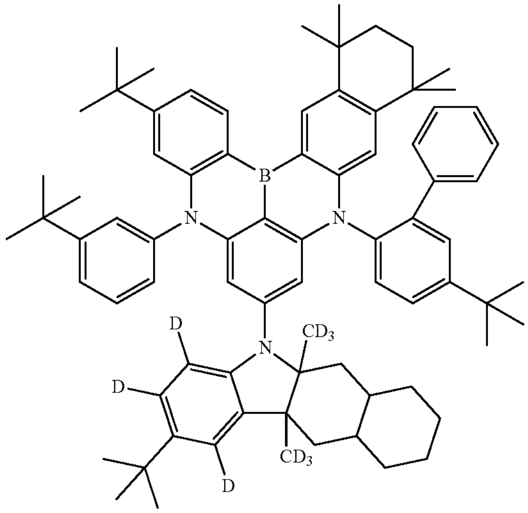
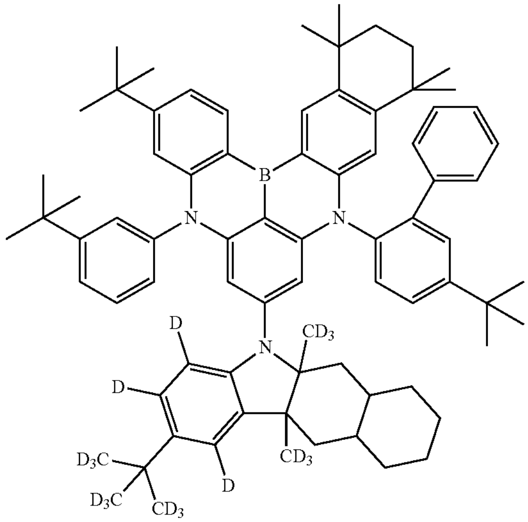
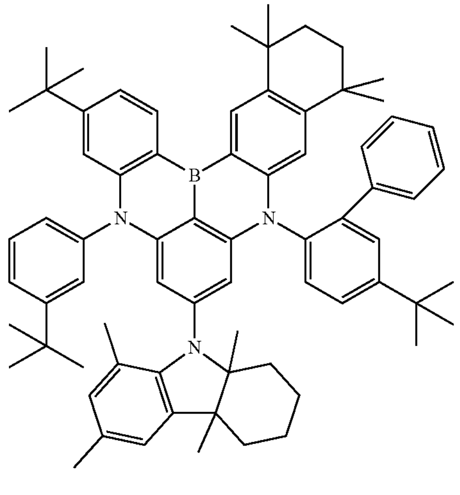

-continued
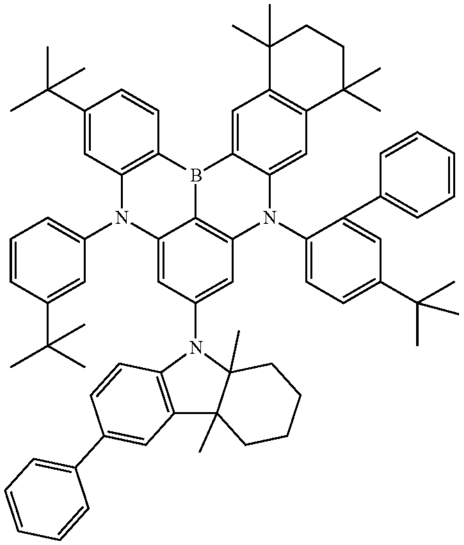
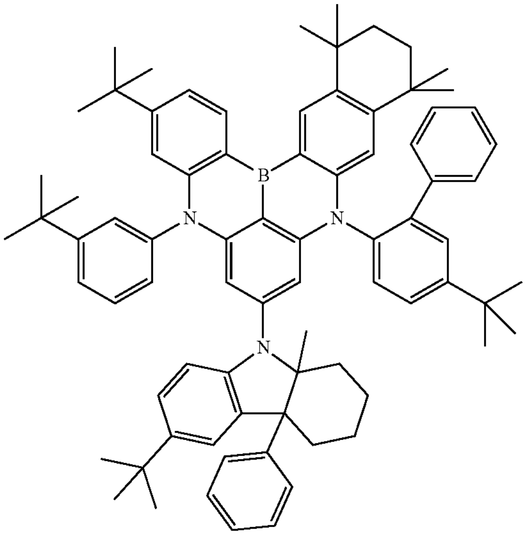
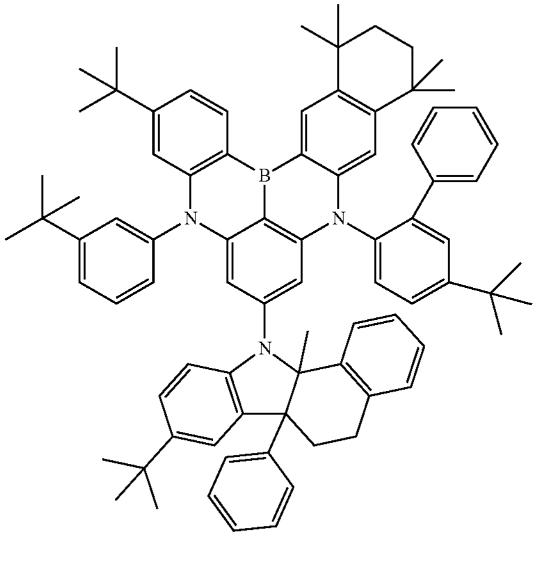
-continued
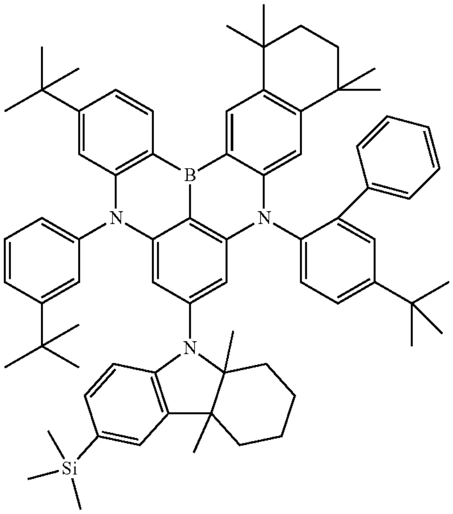
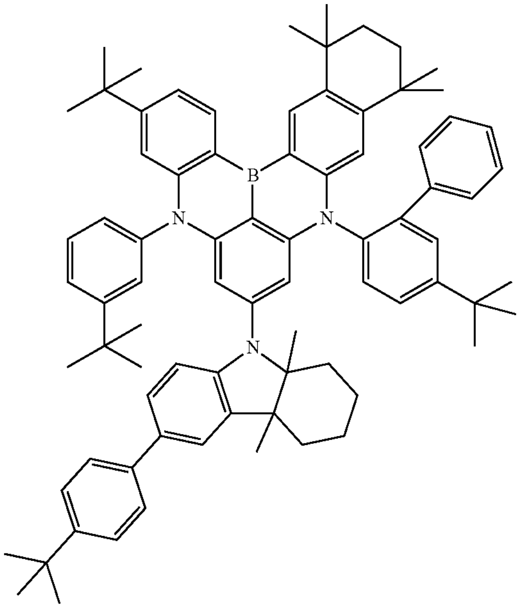
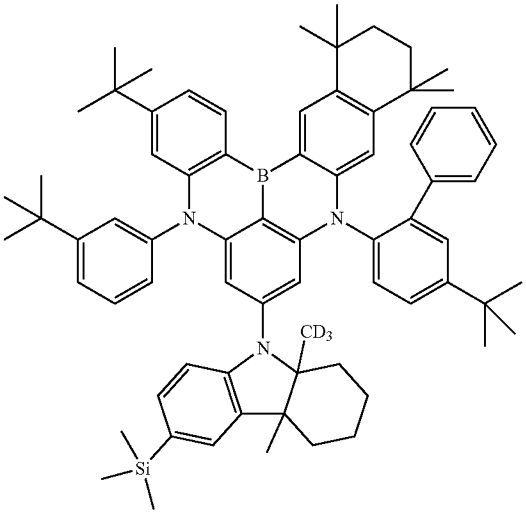

-continued
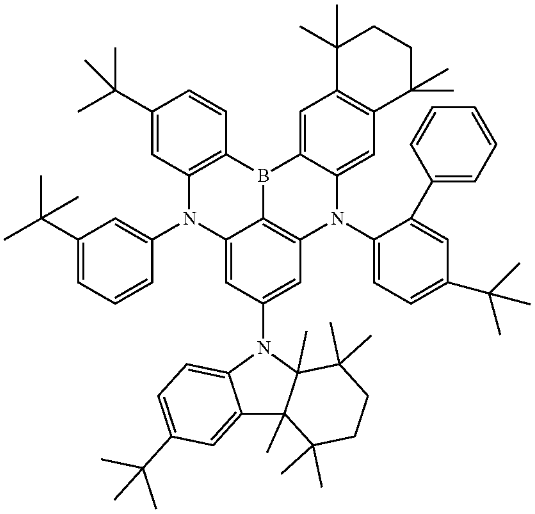
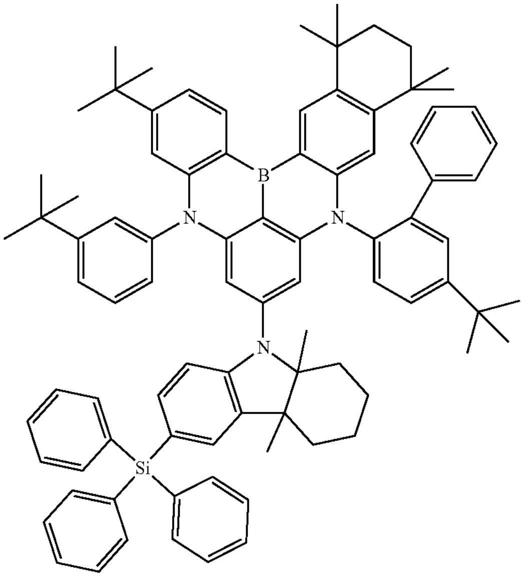
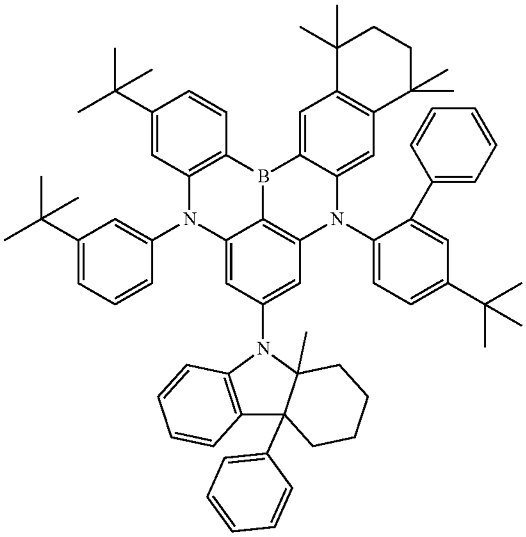
-continued
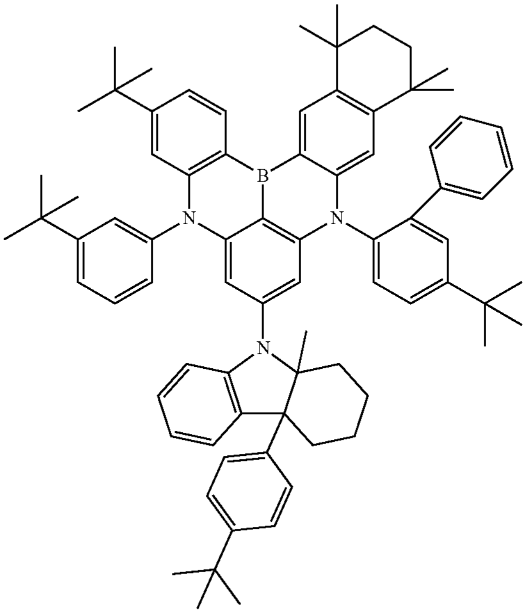
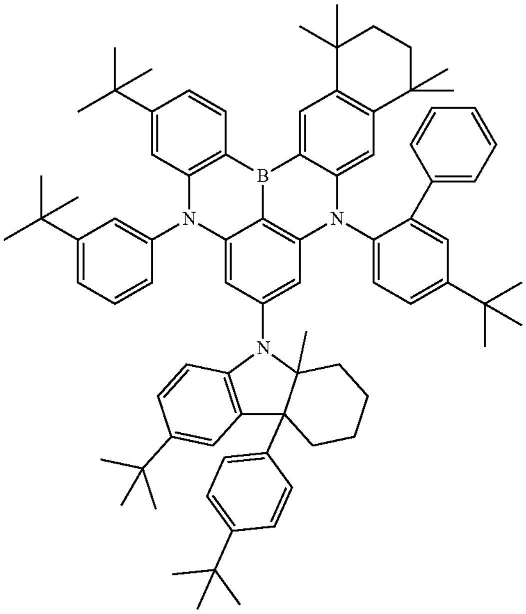

-continued
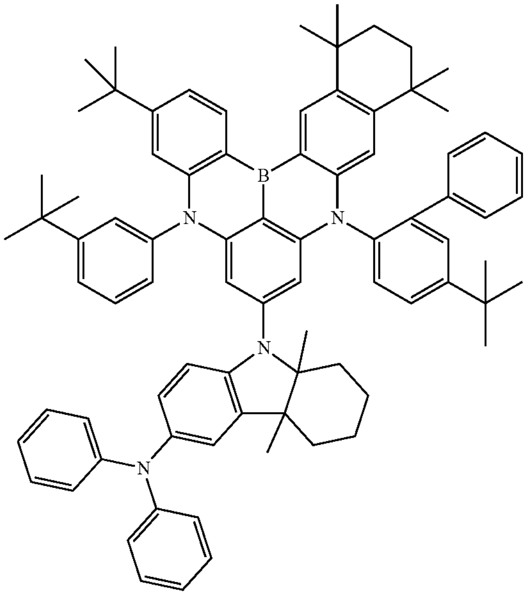
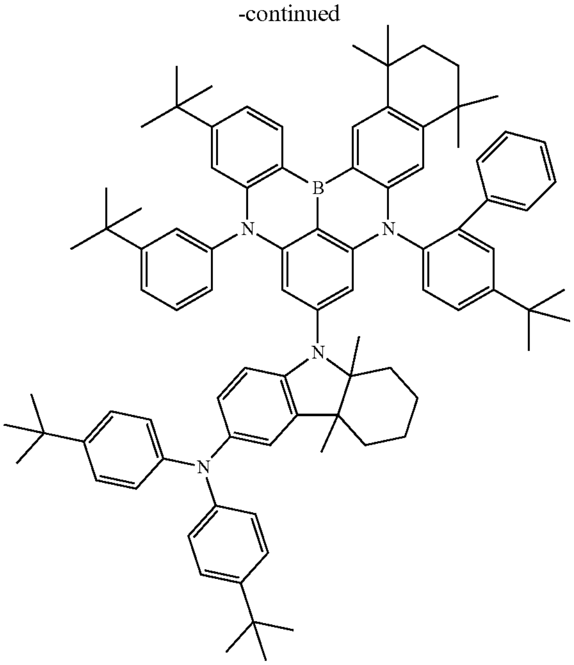
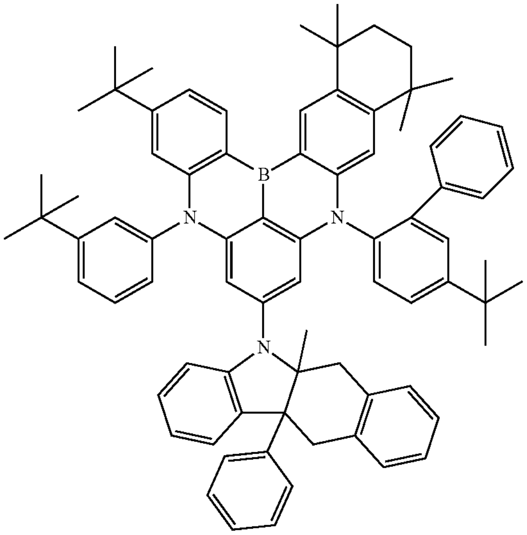
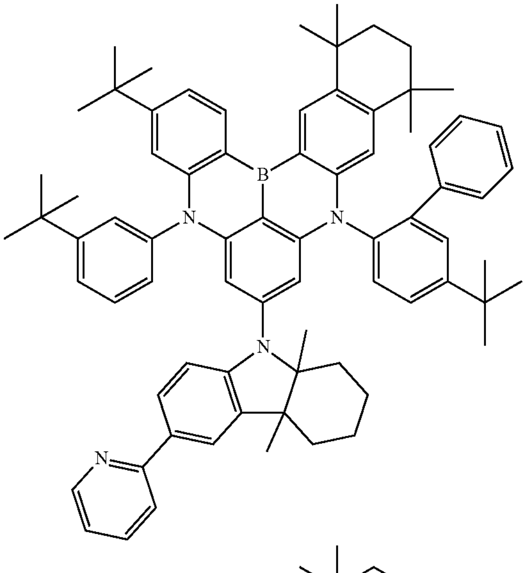
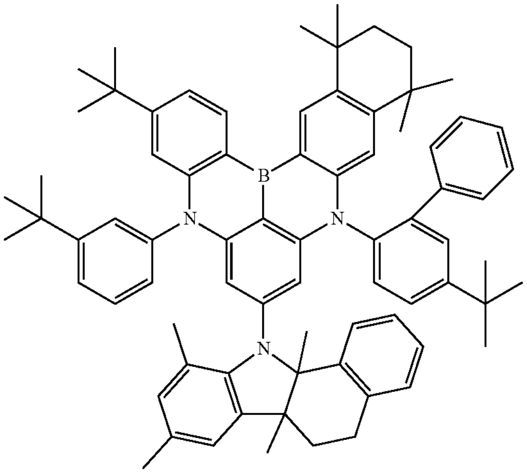
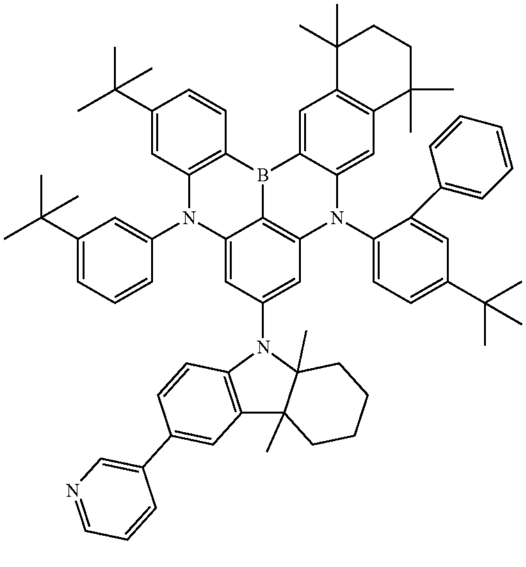

-continued
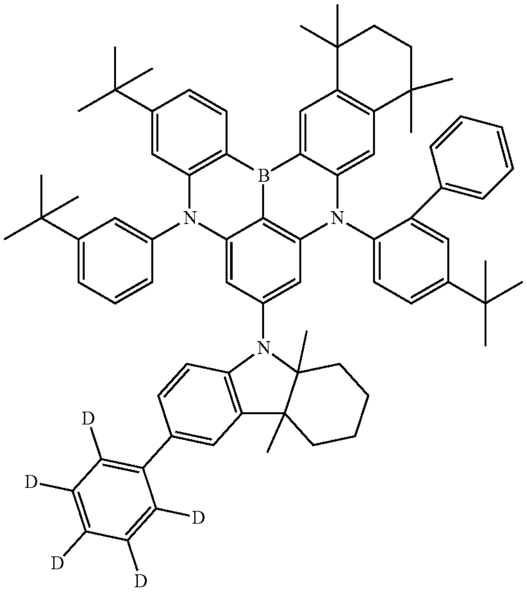 [SMILES: [2H]c1c([2H])c([2H])c(-c2ccc3c(c2)C2(C)CCCCC2(C)N3c2cc3c4c(c2)N(c2ccc(C(C)(C)C)cc2-c2ccccc2)c2cc5c(cc2B4c2ccc(C(C)(C)C)cc2N3c2cccc(C(C)(C)C)c2)C(C)(C)CCC5(C)C)c([2H])c1[2H]]
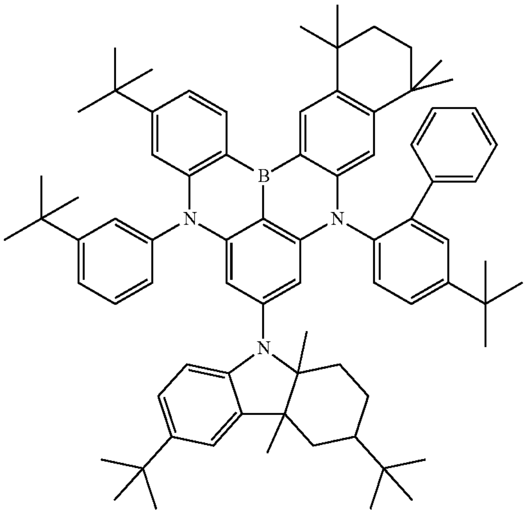
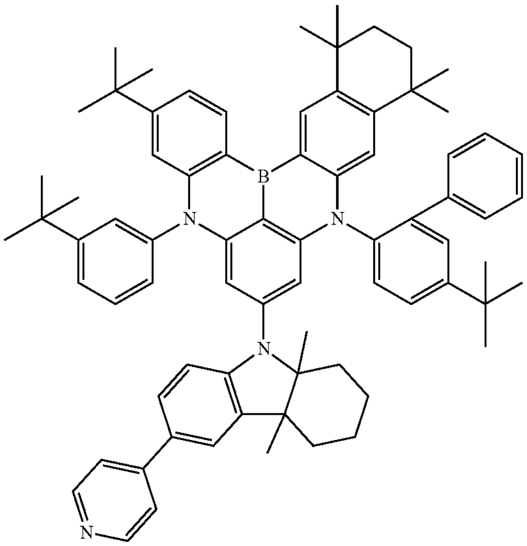
-continued
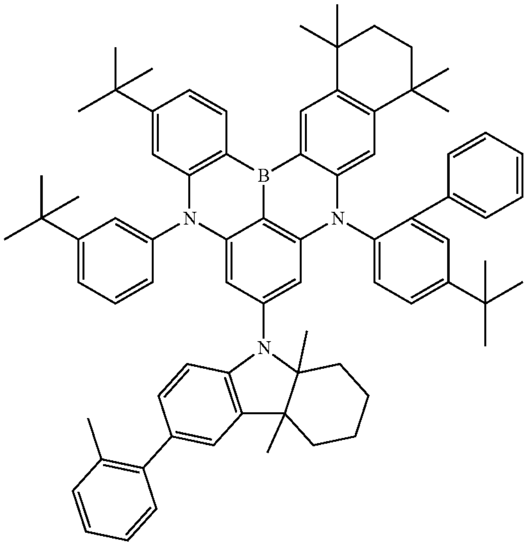
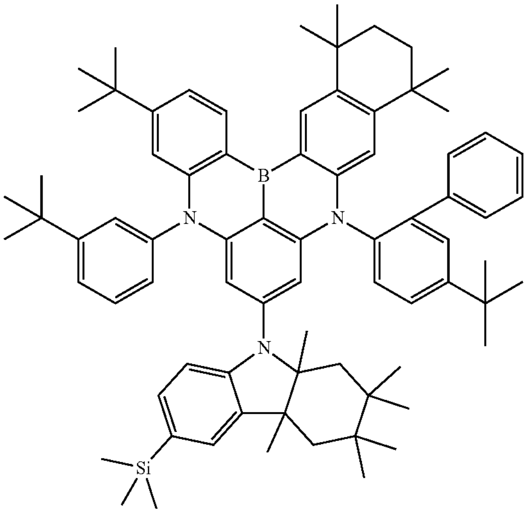
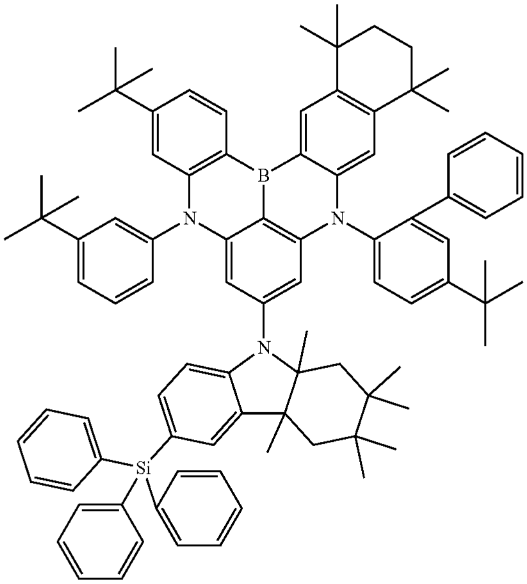

-continued
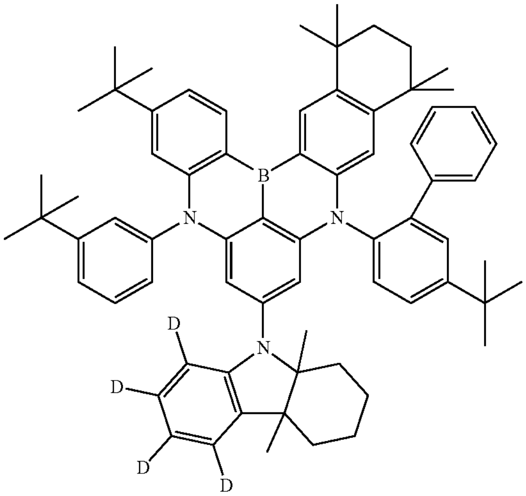
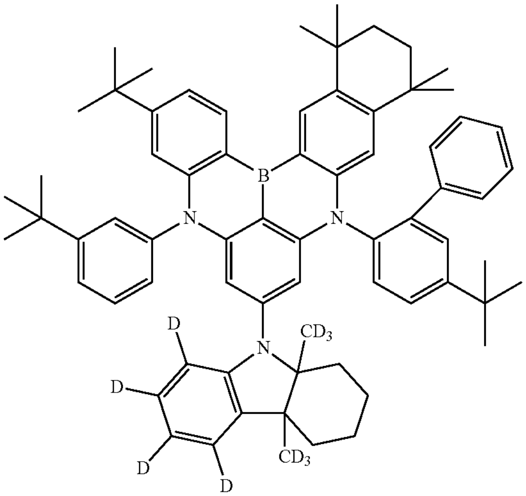
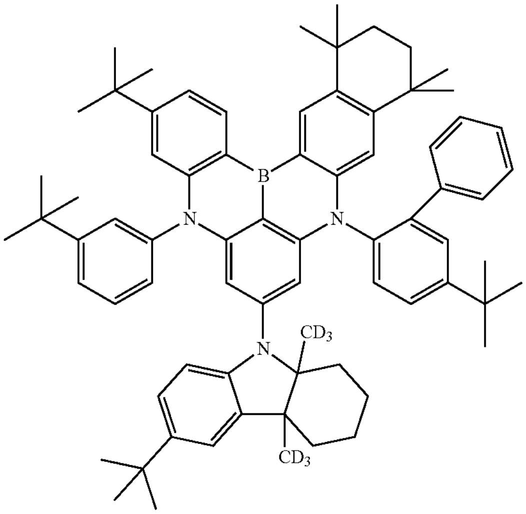
-continued
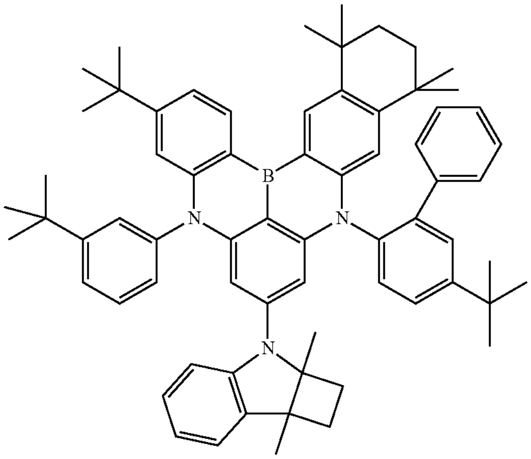
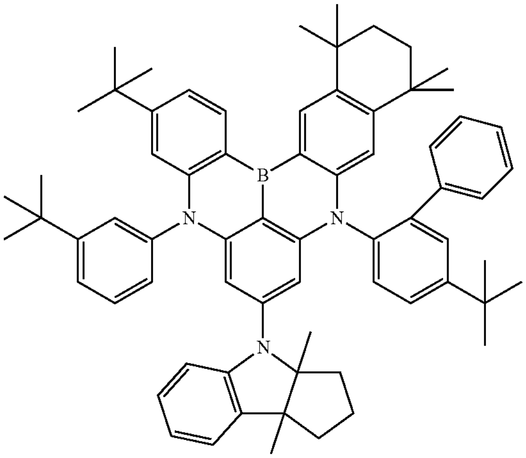
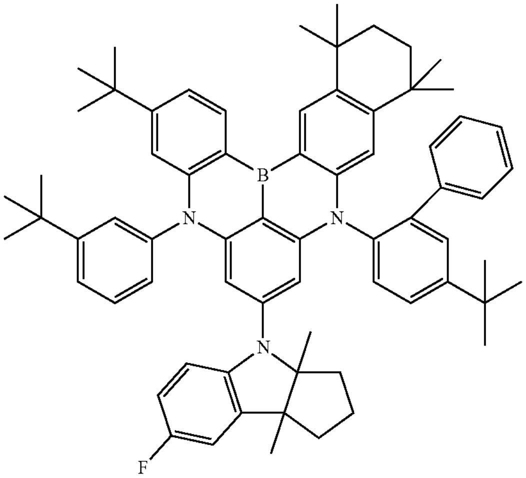

-continued
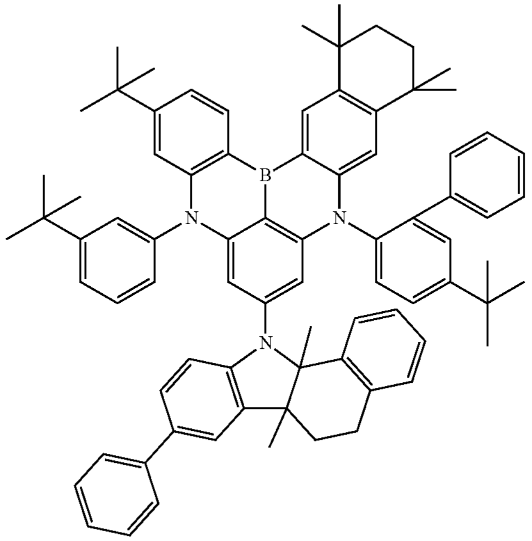
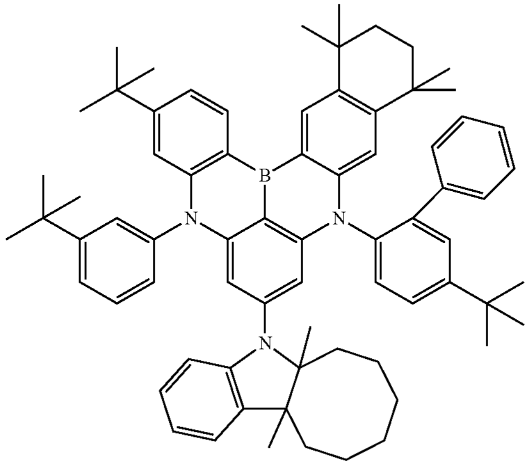
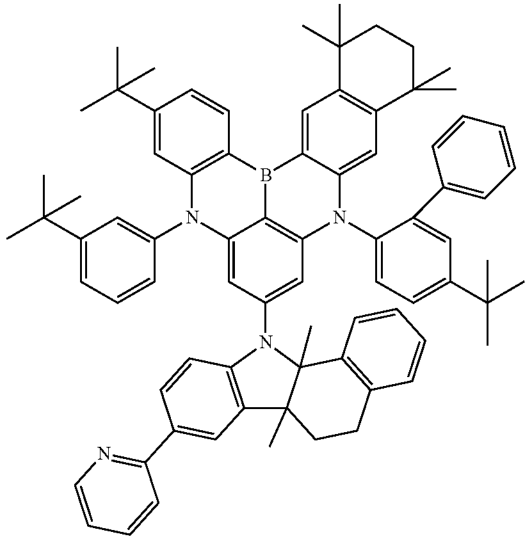
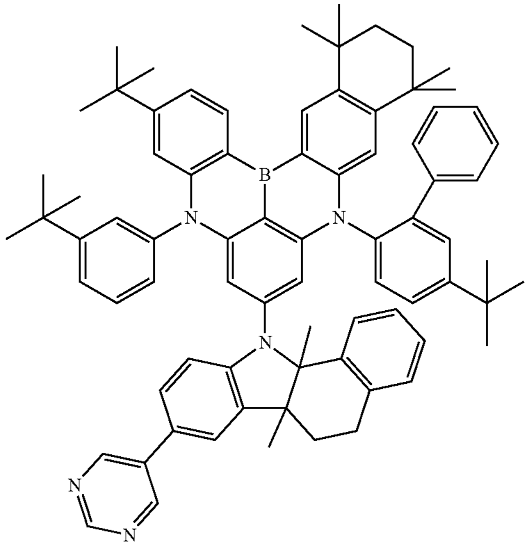
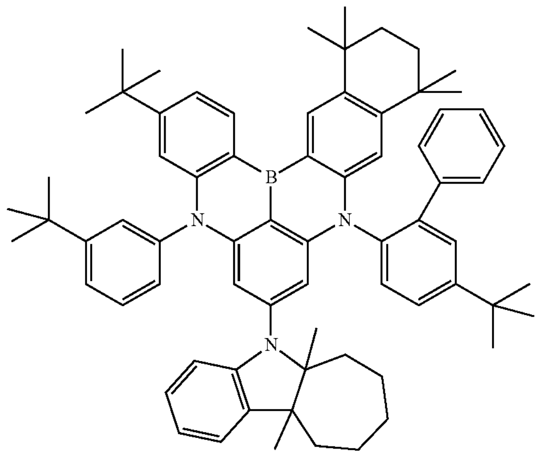
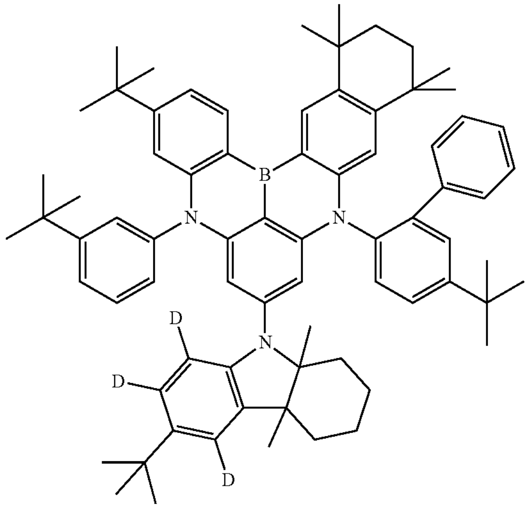

-continued
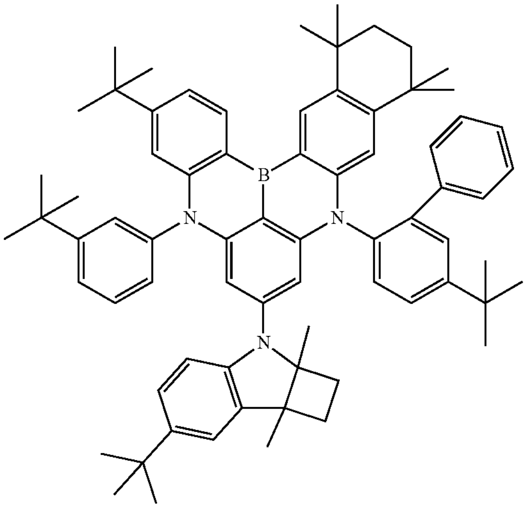
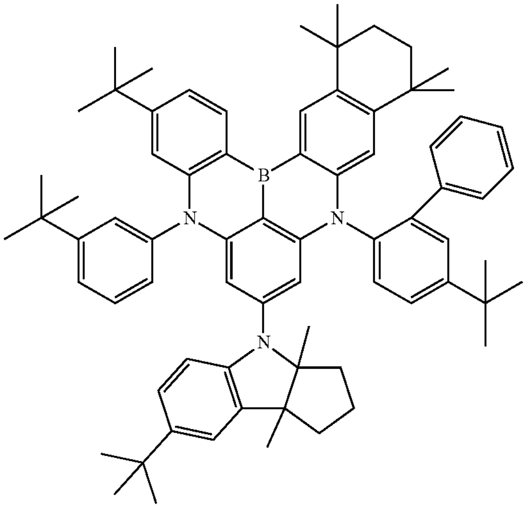
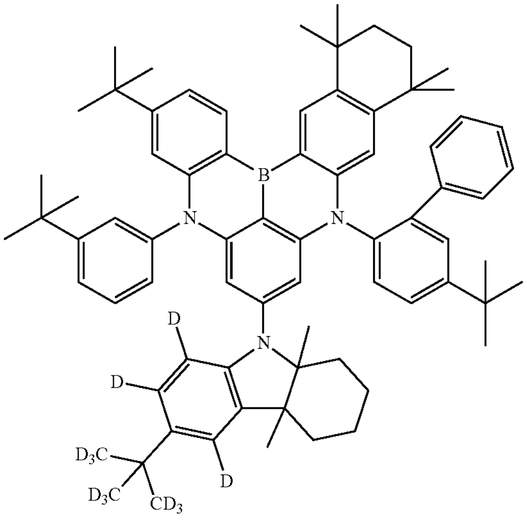
-continued
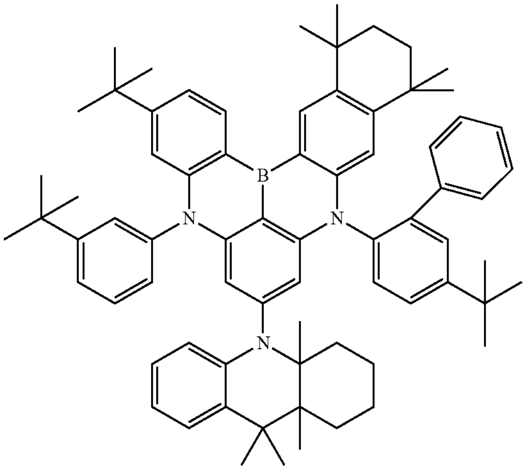
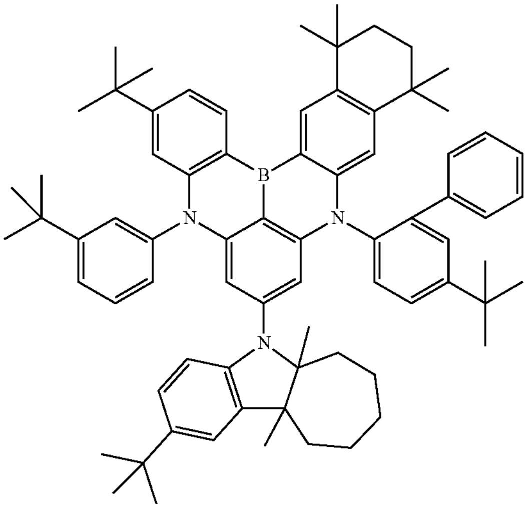
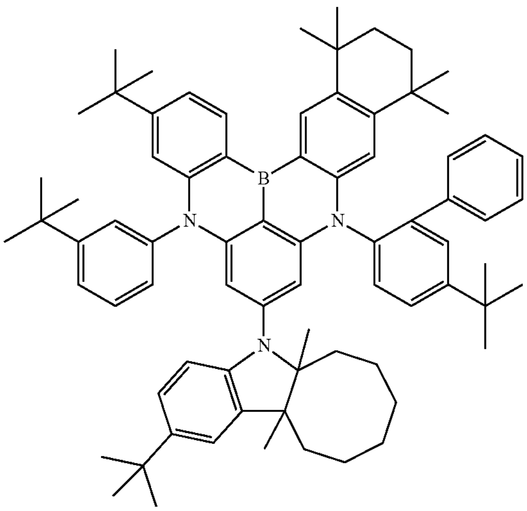

-continued
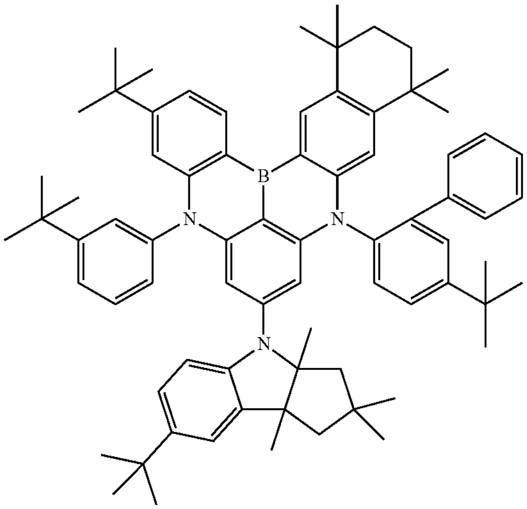
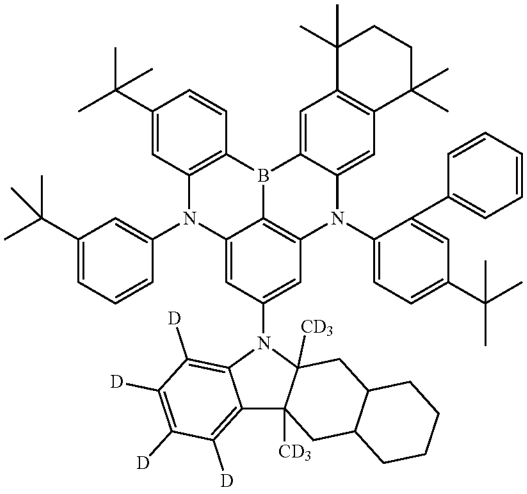
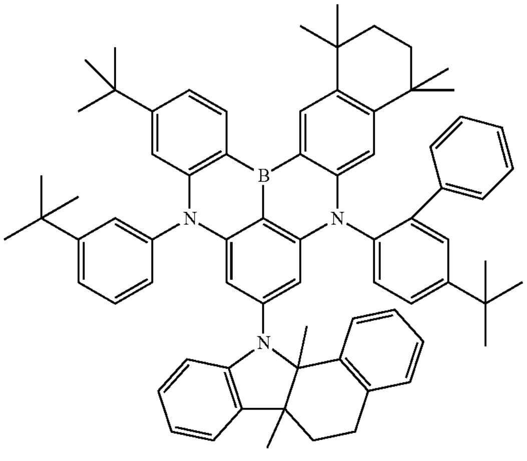
-continued
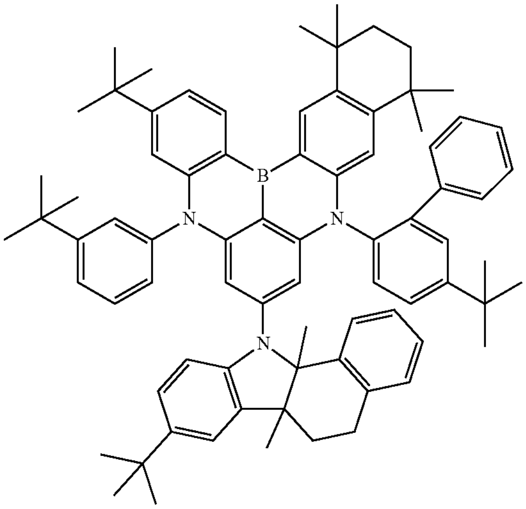
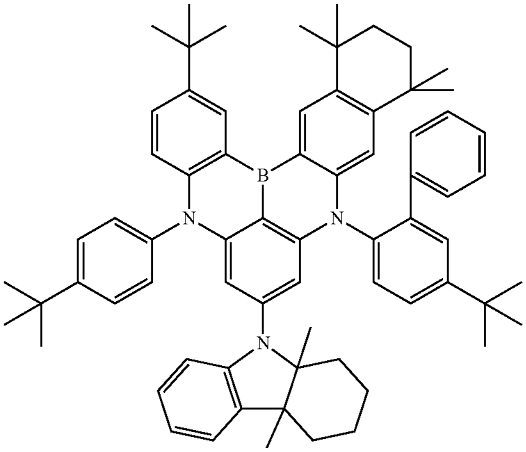
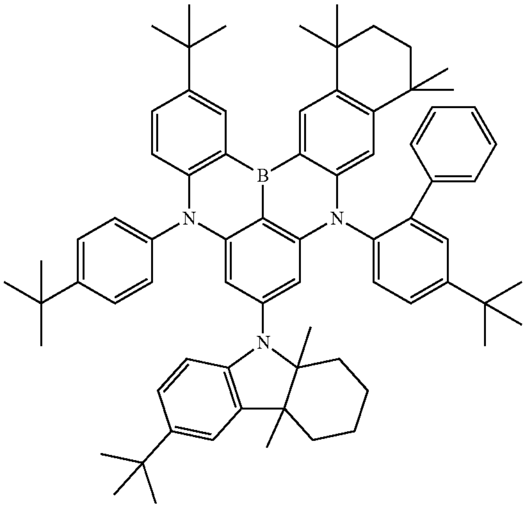

-continued
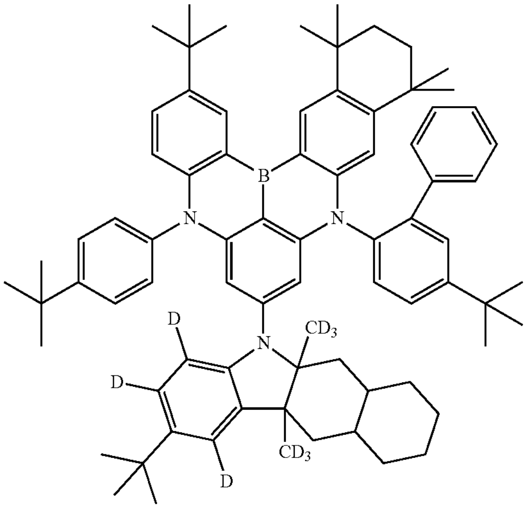
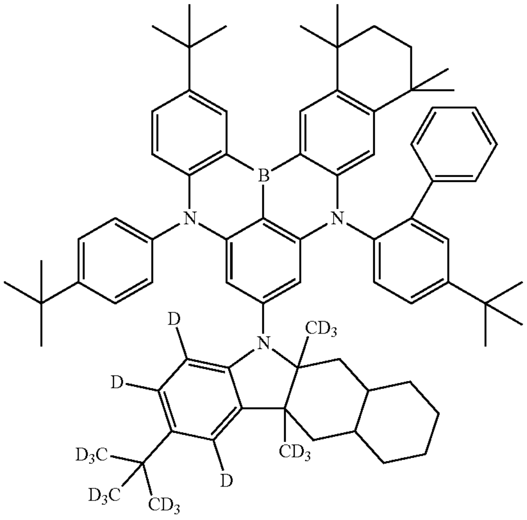
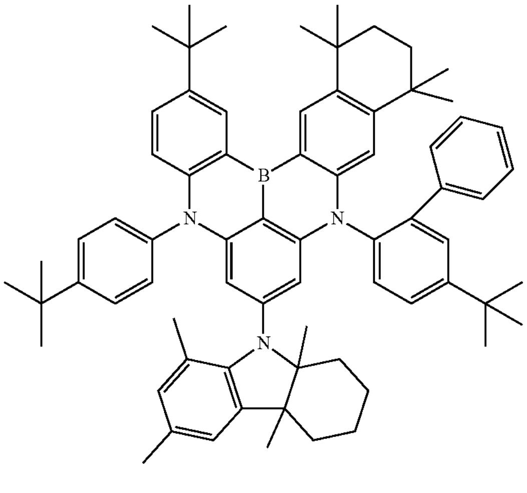
-continued
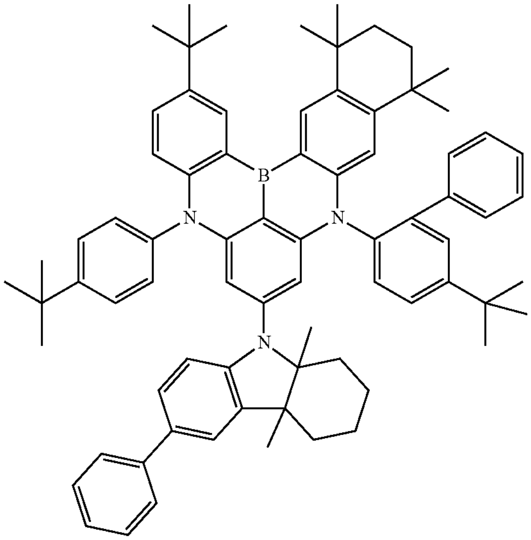
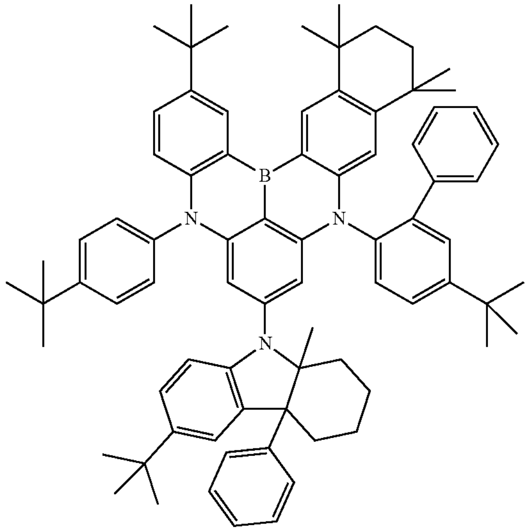
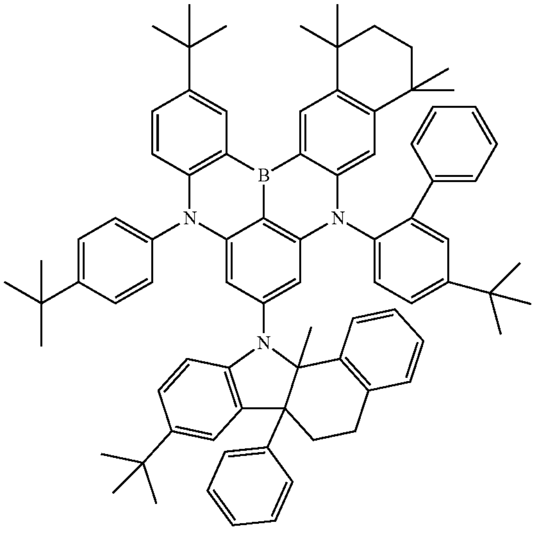

-continued
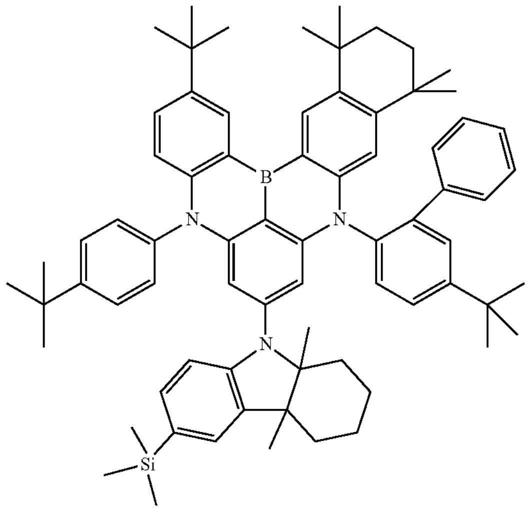
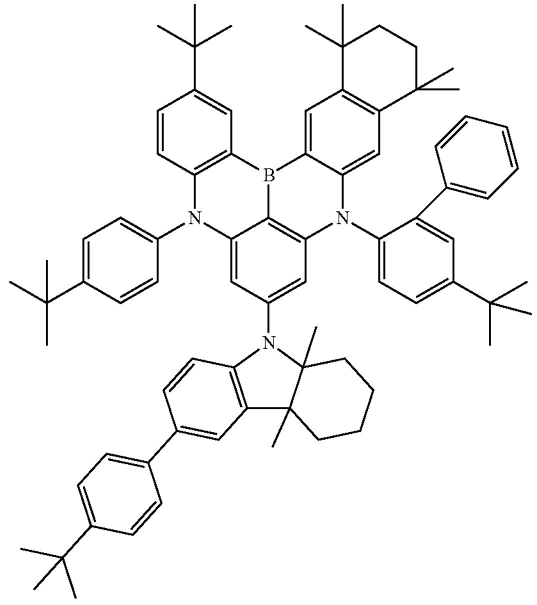
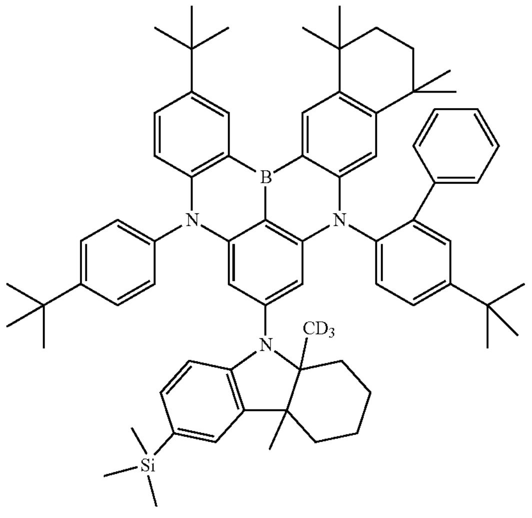
-continued
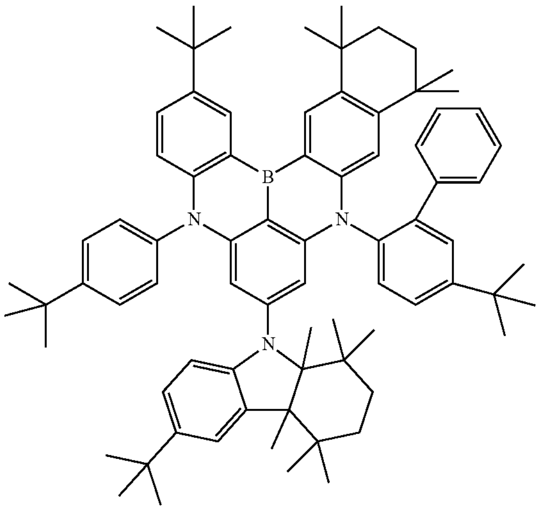
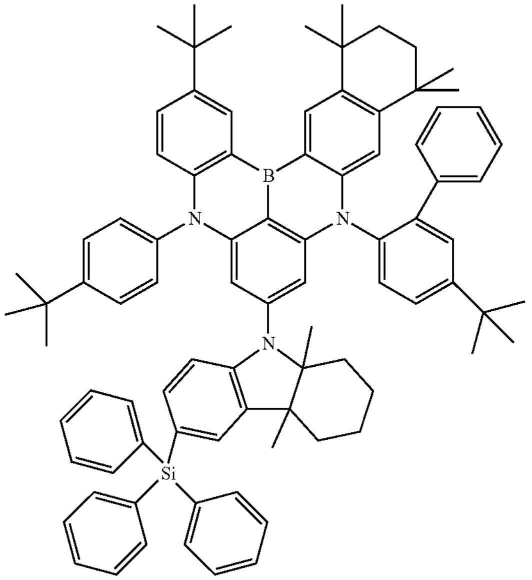
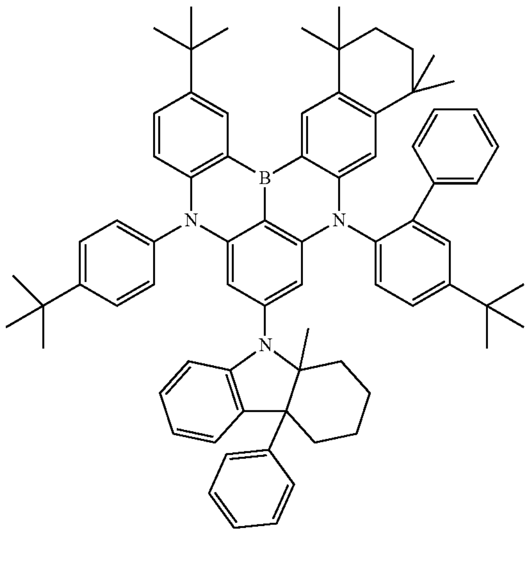

-continued
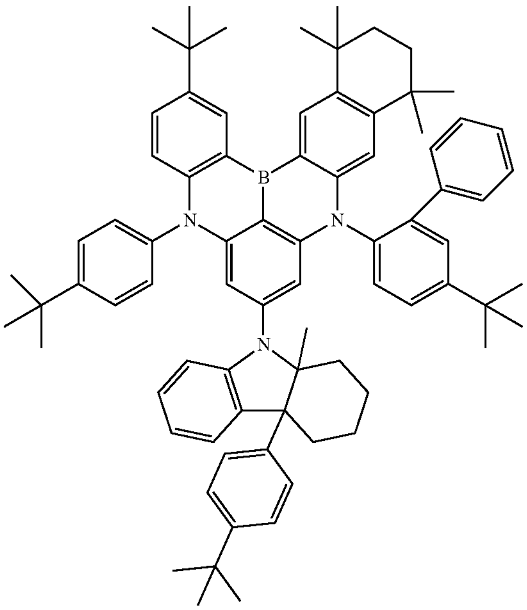
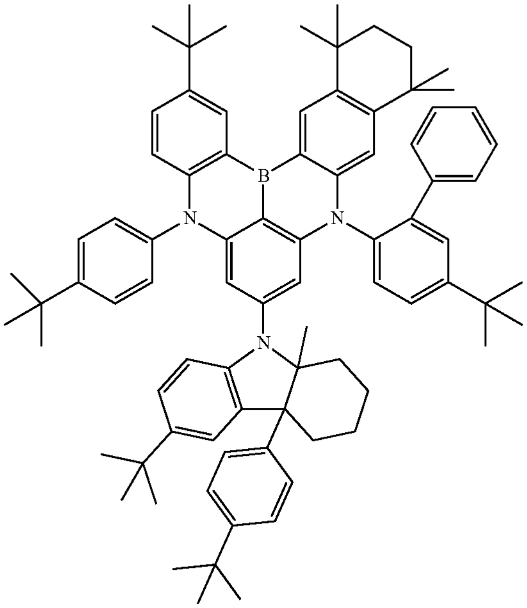
-continued
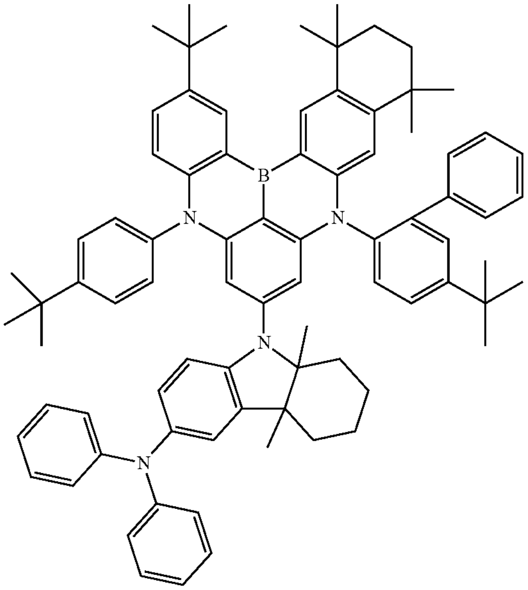
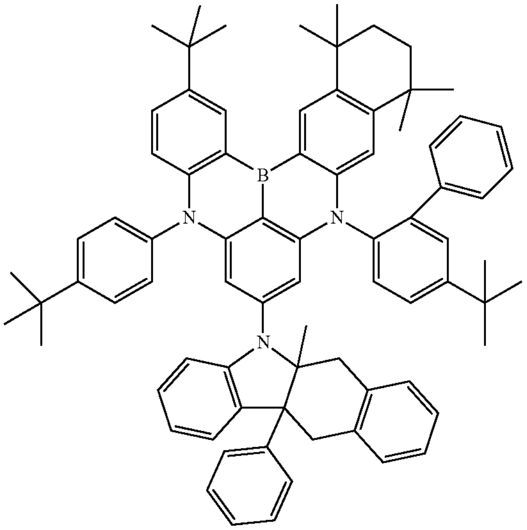
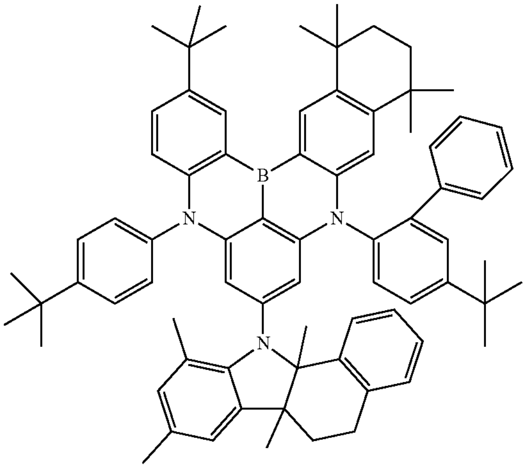

-continued
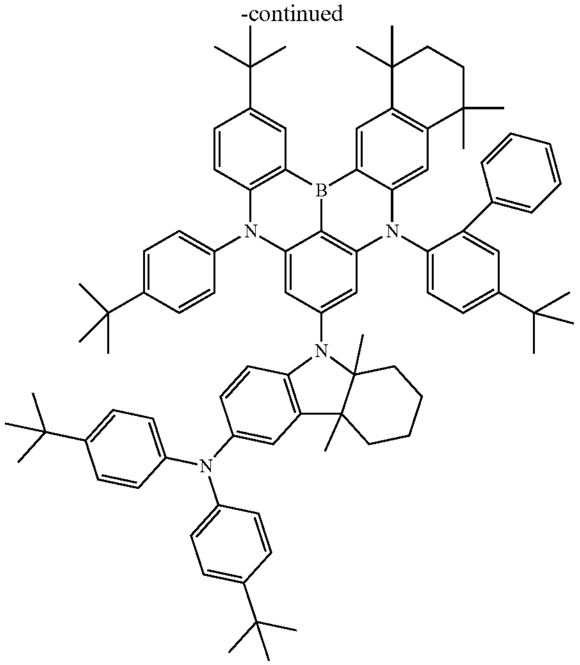
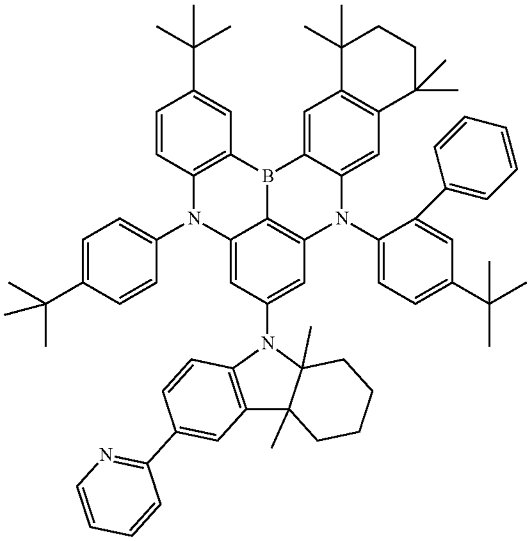
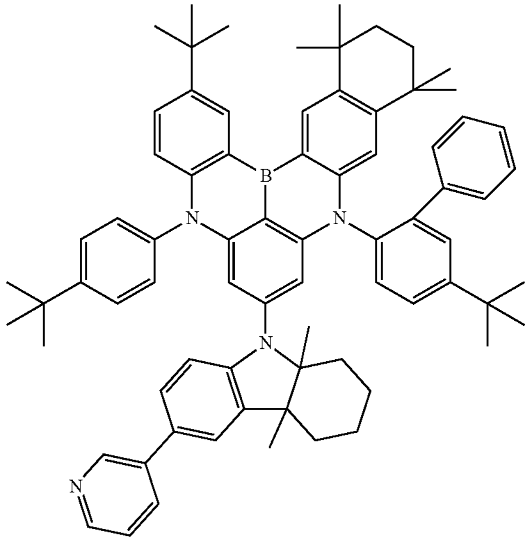
-continued
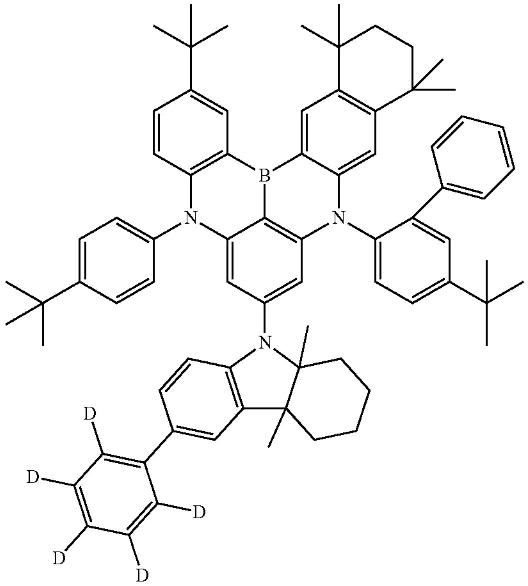
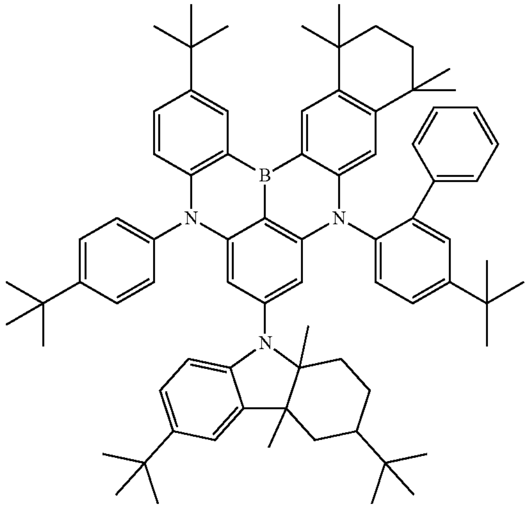
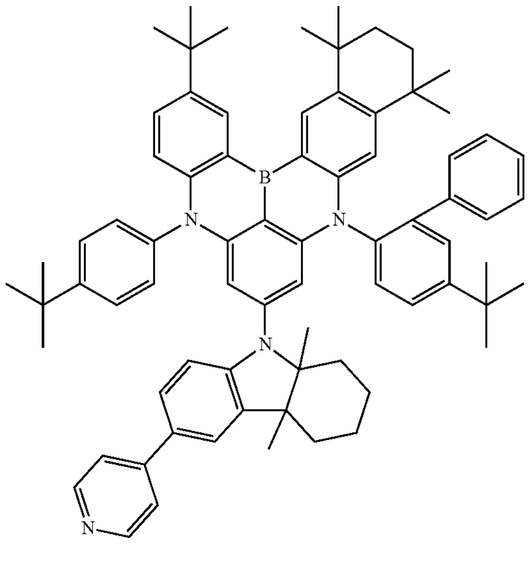

-continued
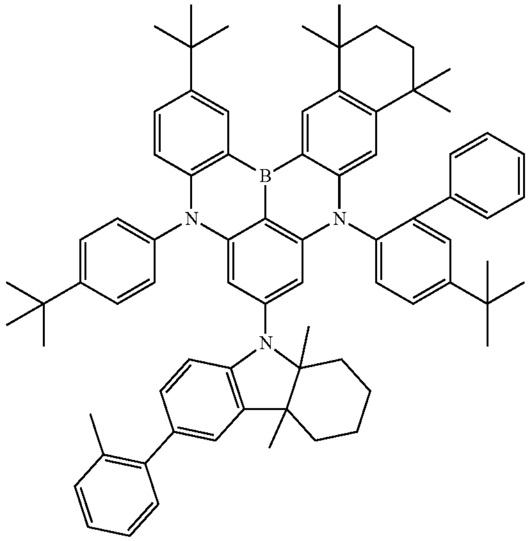
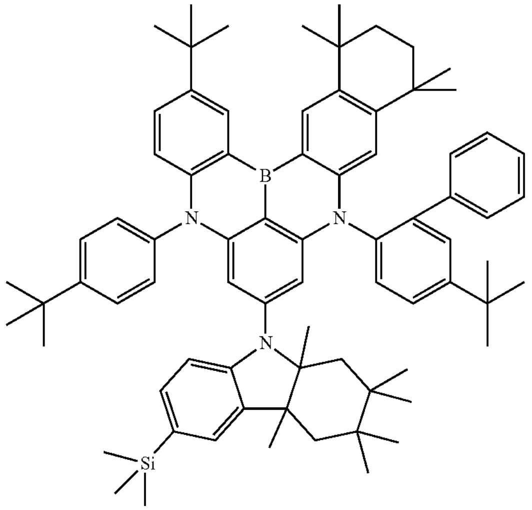
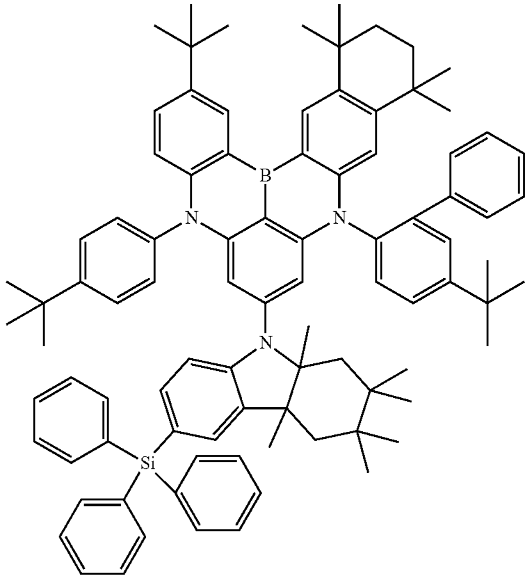
-continued
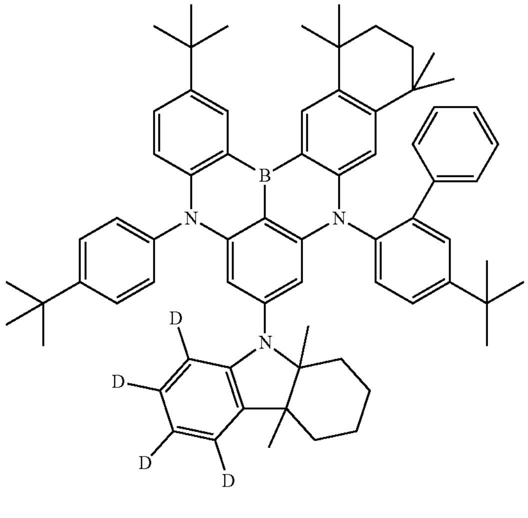
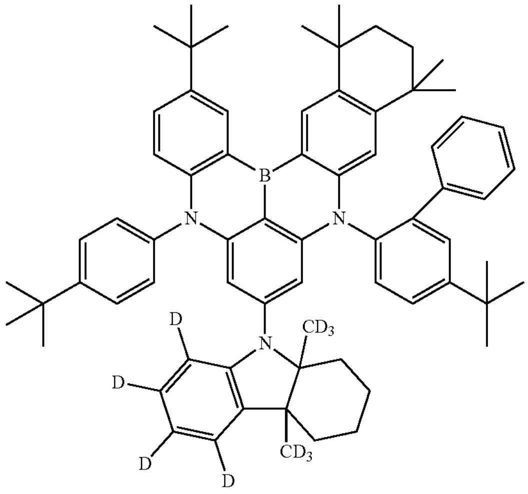
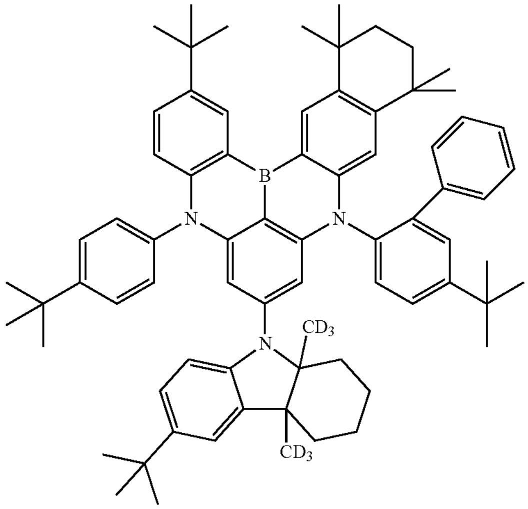

-continued
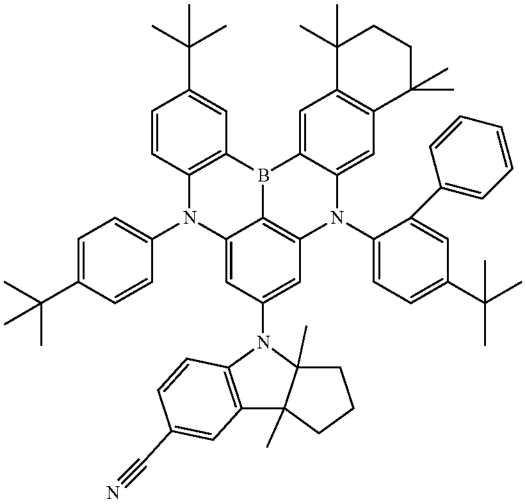
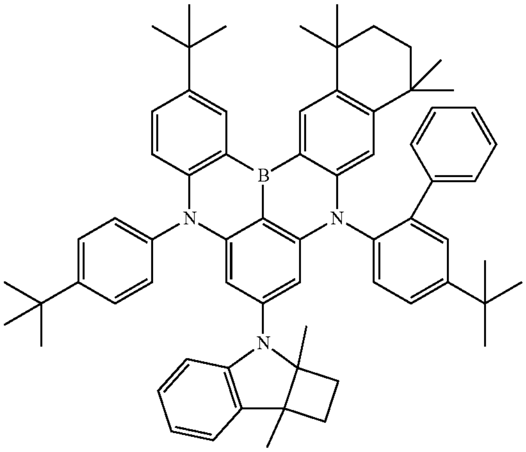
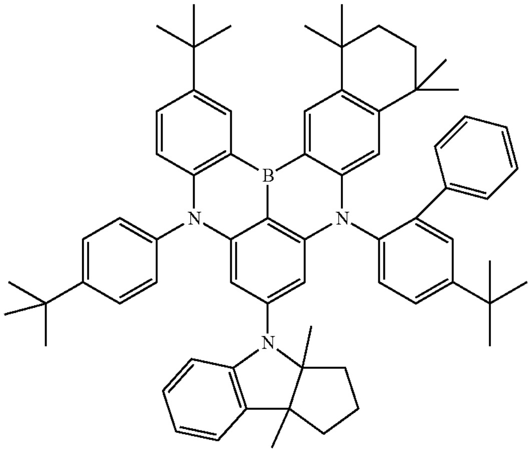
-continued
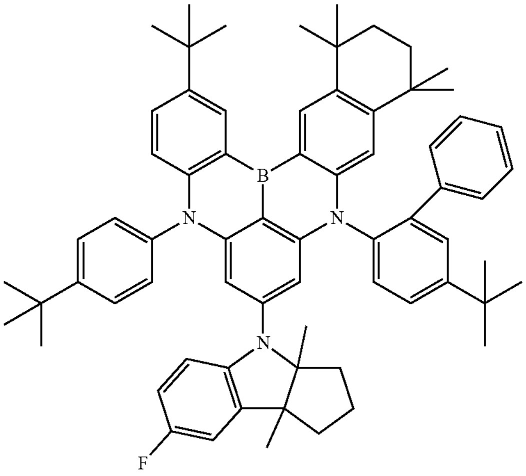
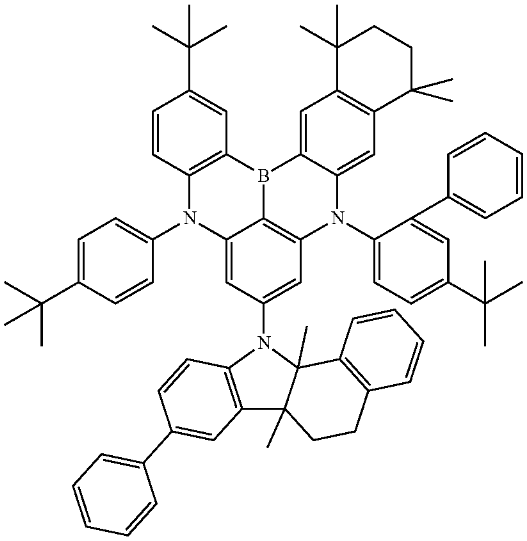
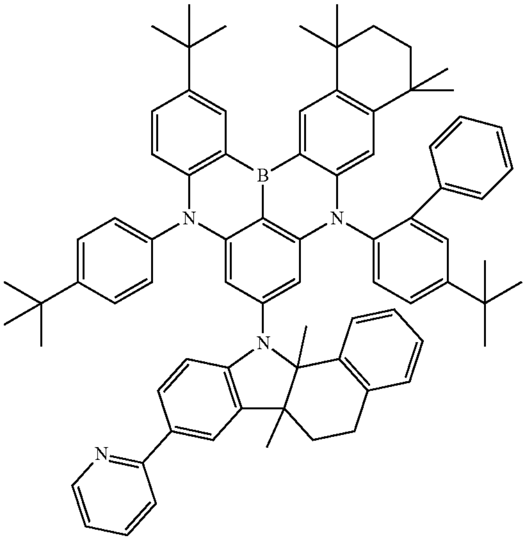

-continued
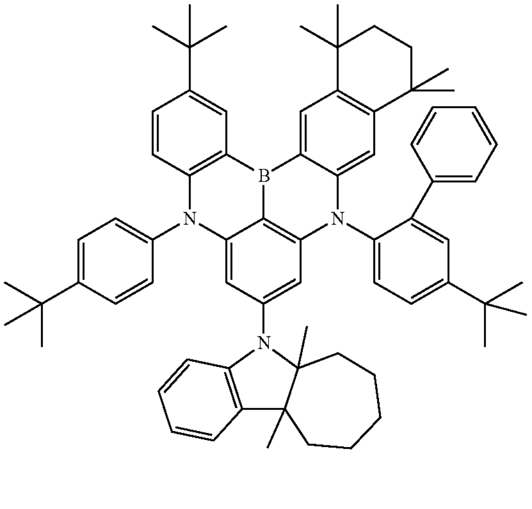
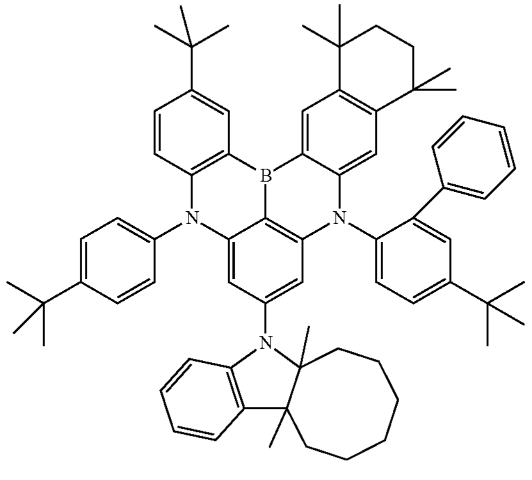
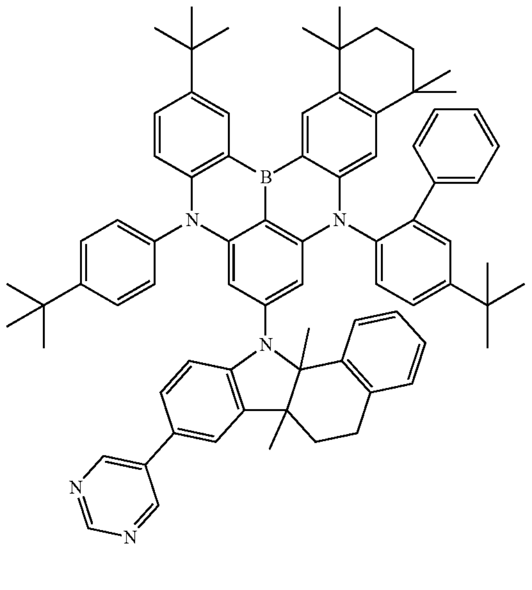
-continued
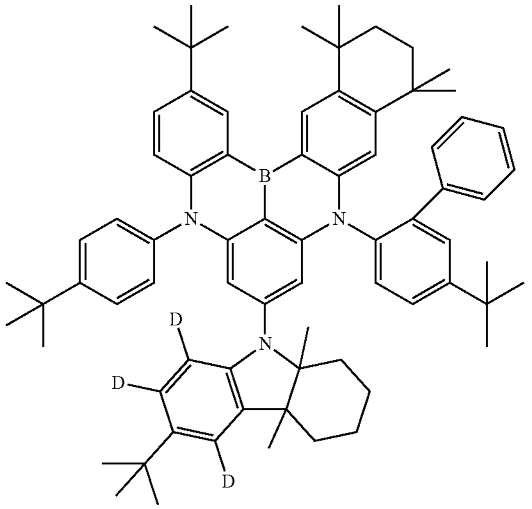
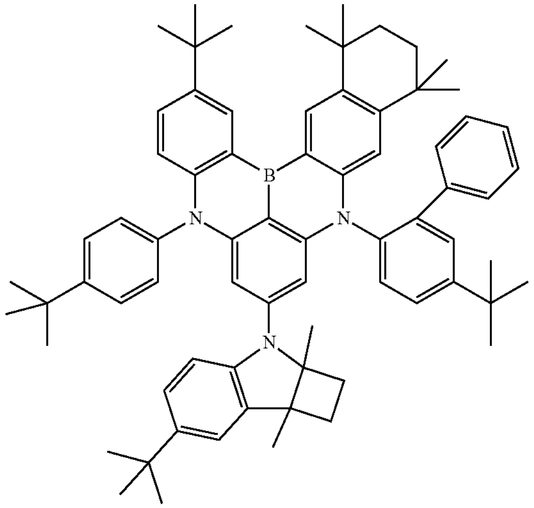
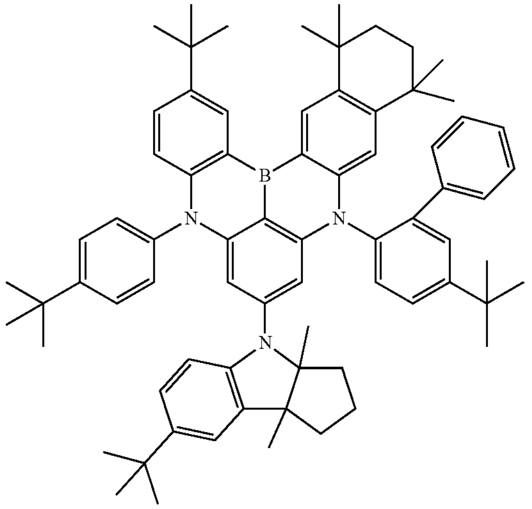

-continued
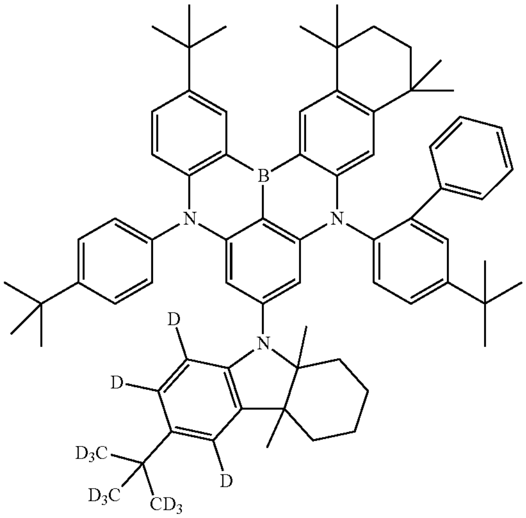
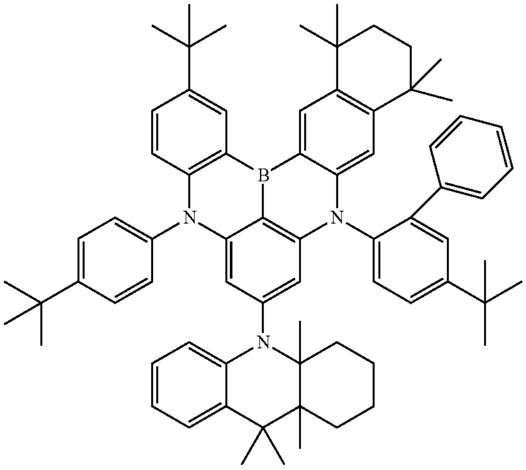
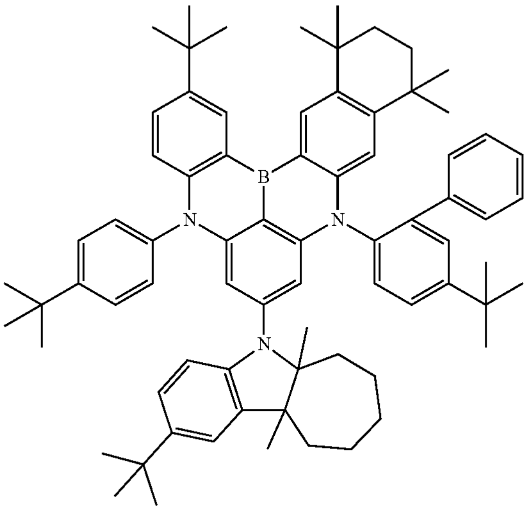
-continued
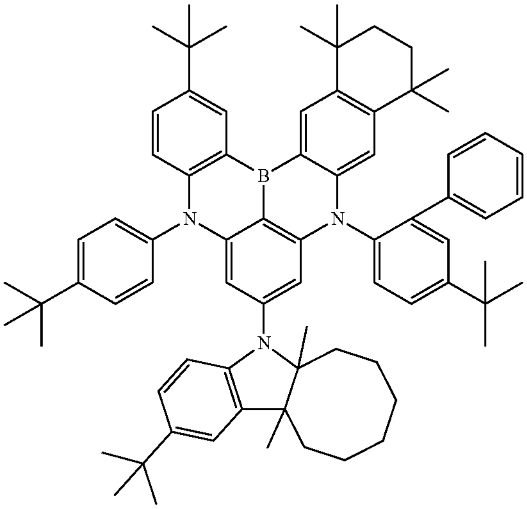
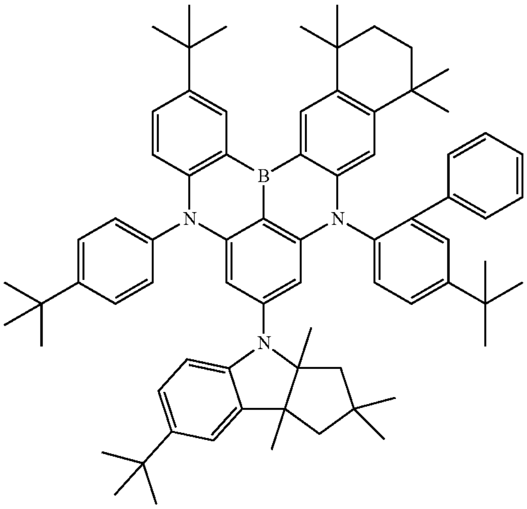
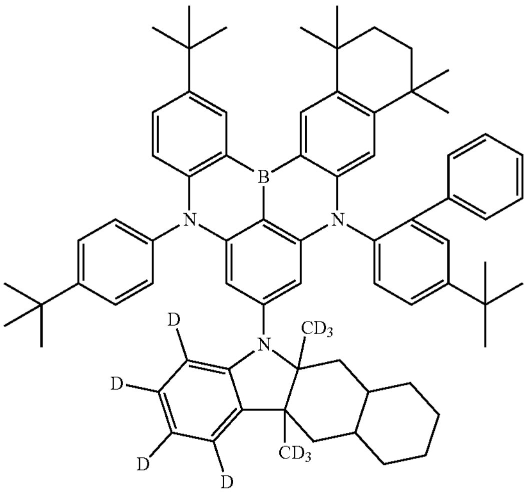

-continued
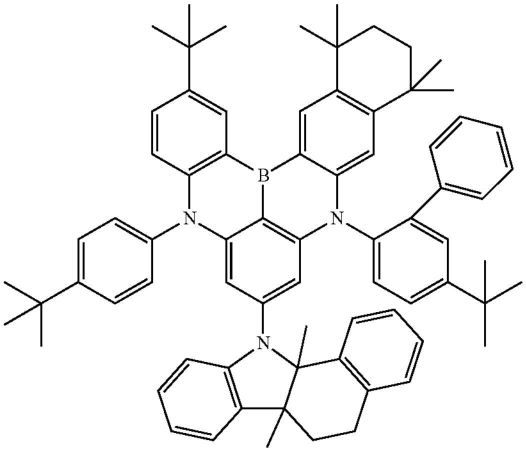
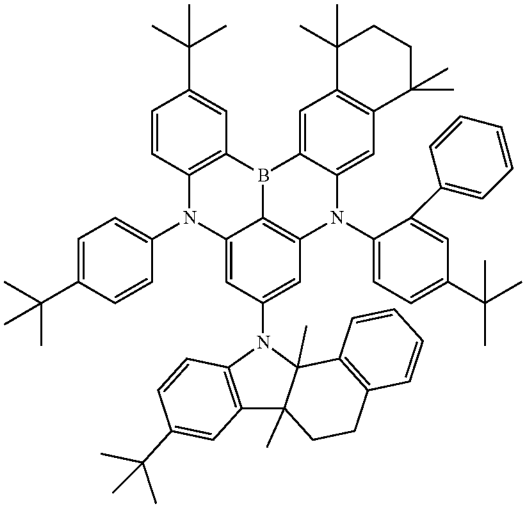
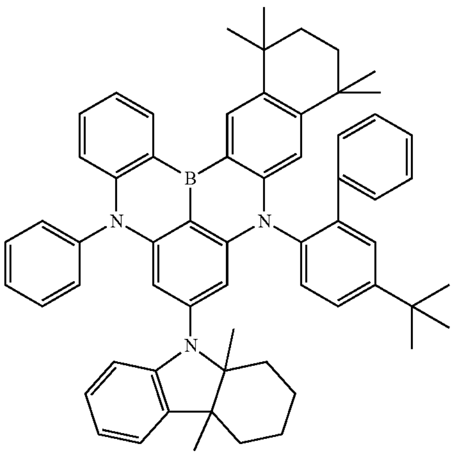
-continued
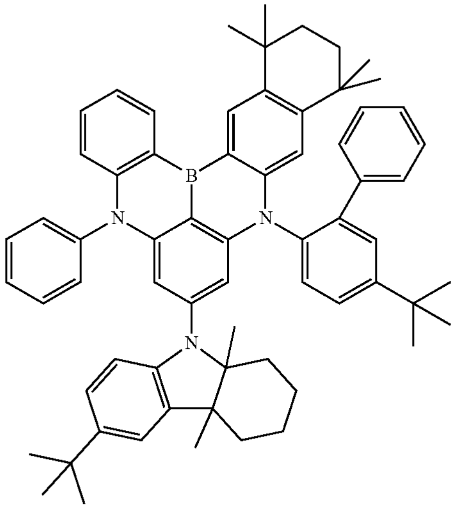
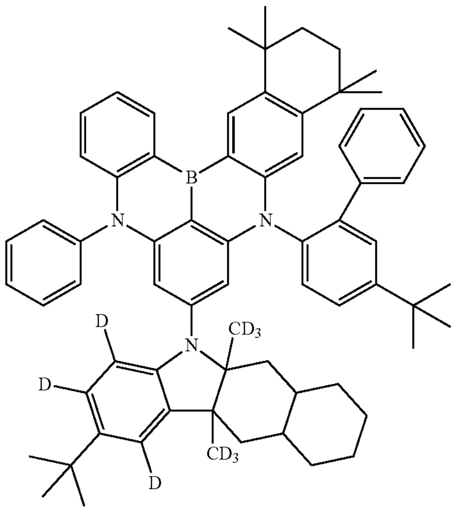
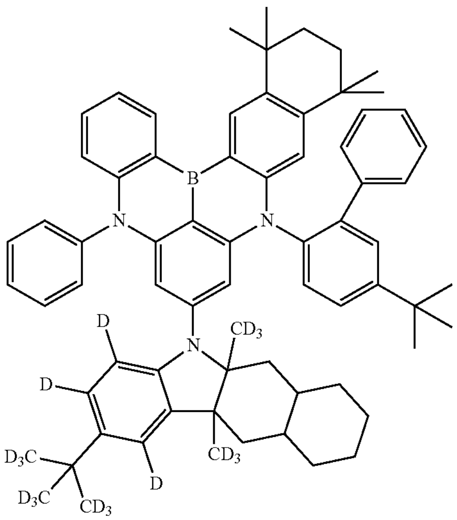

-continued
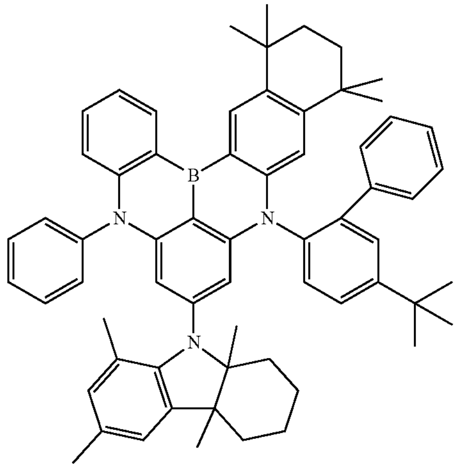
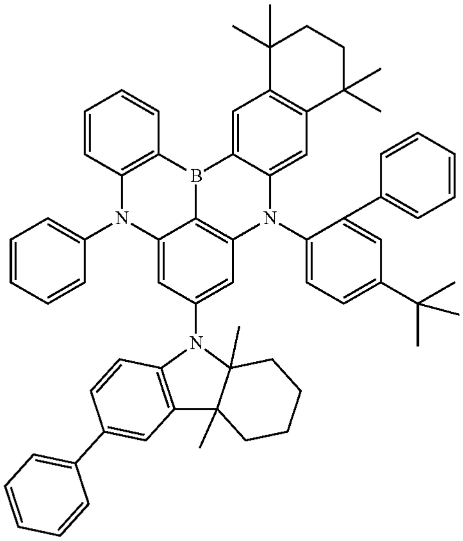
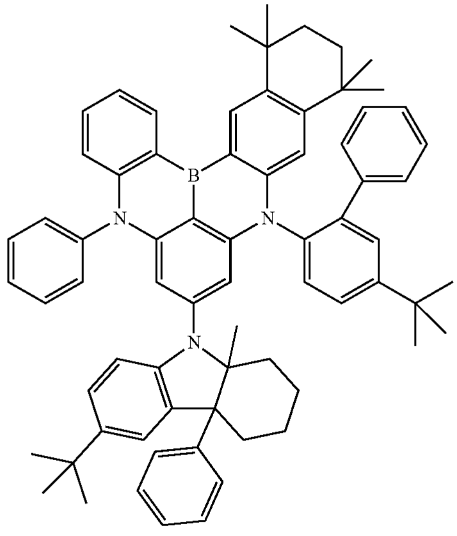
-continued
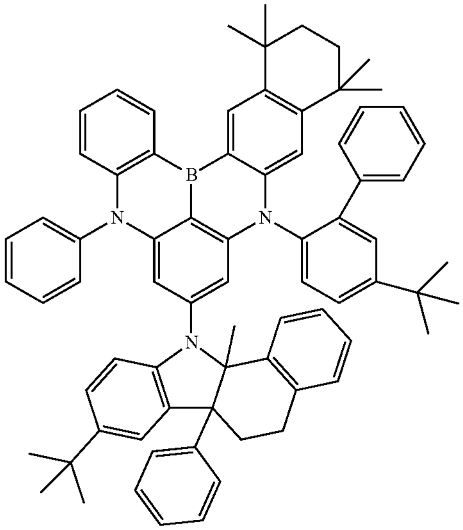
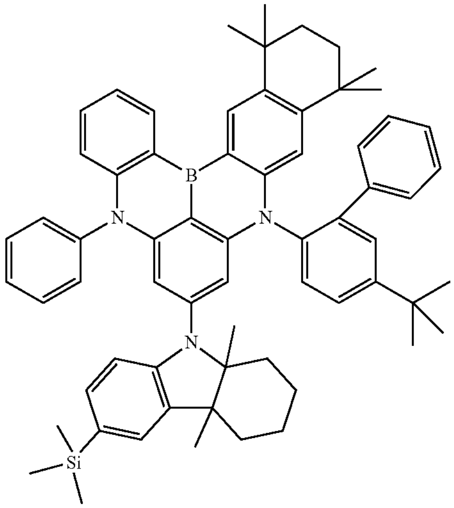
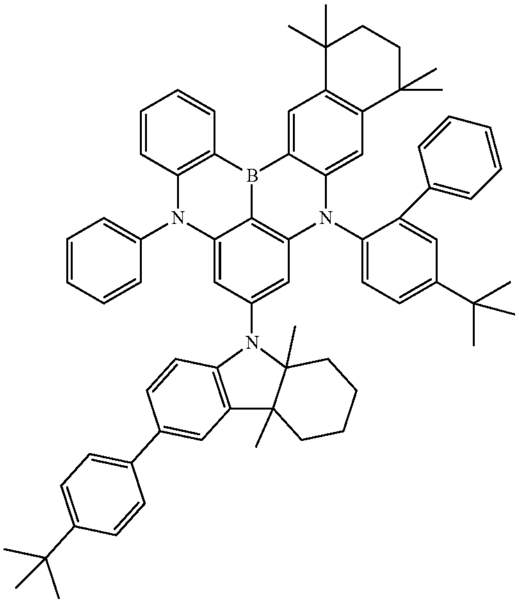

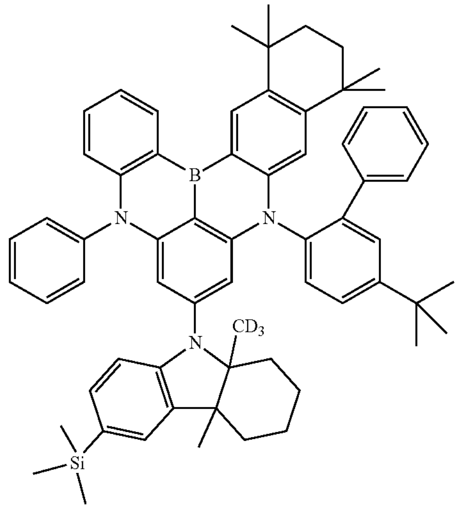
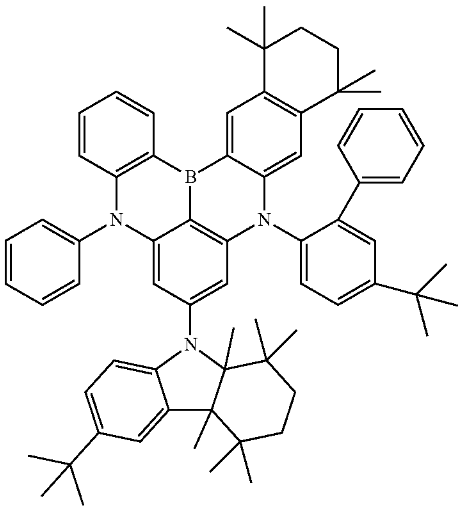
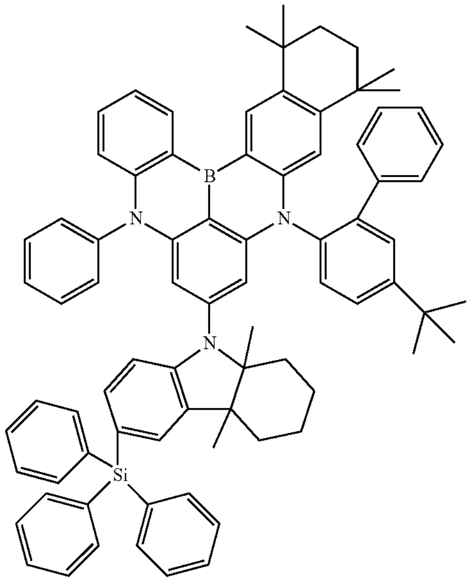
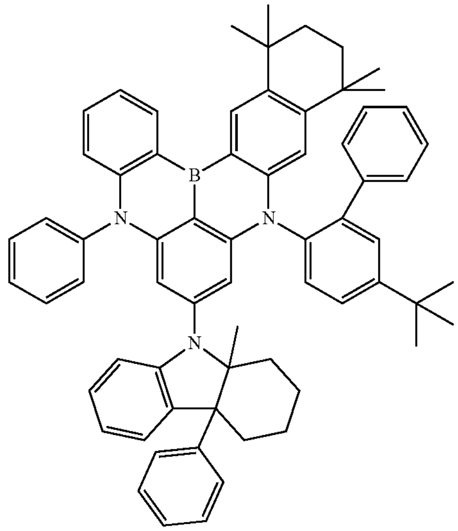
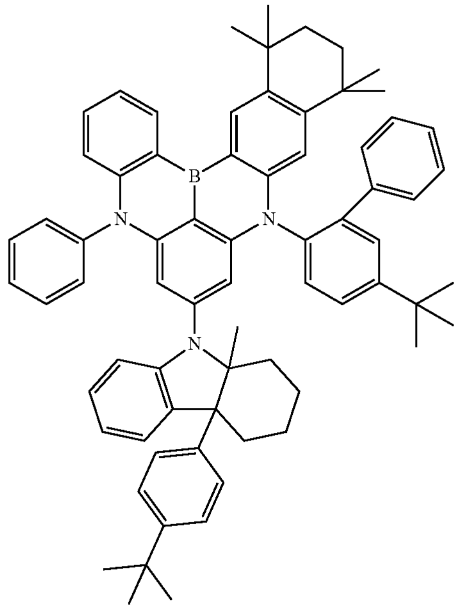

-continued
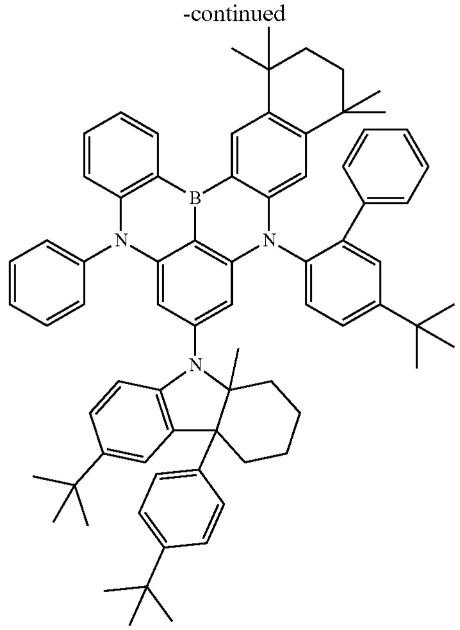
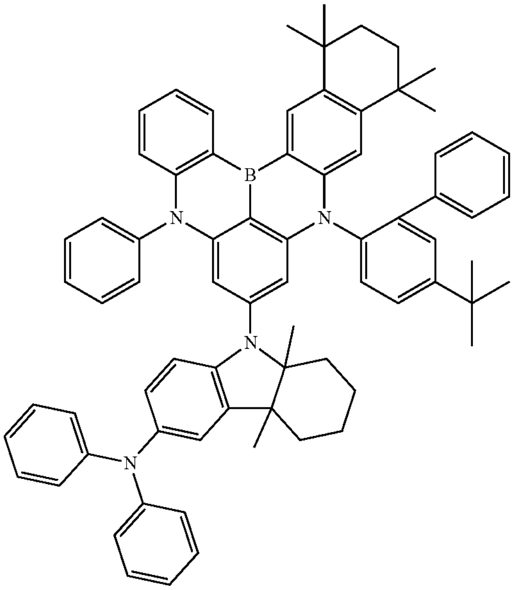
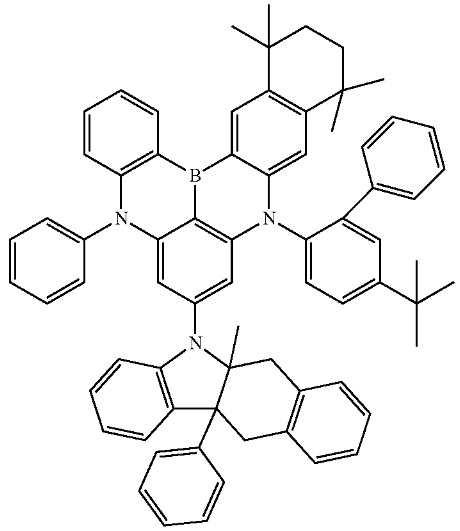
-continued
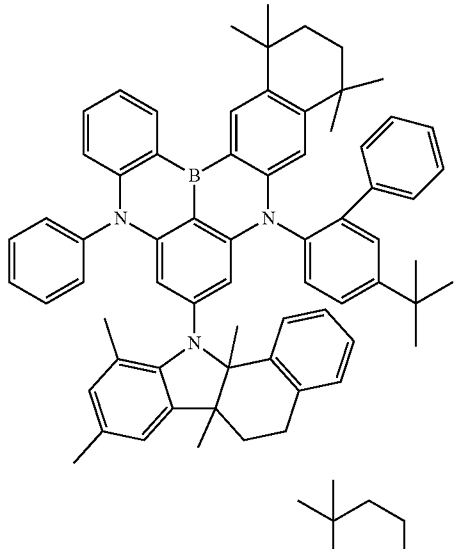
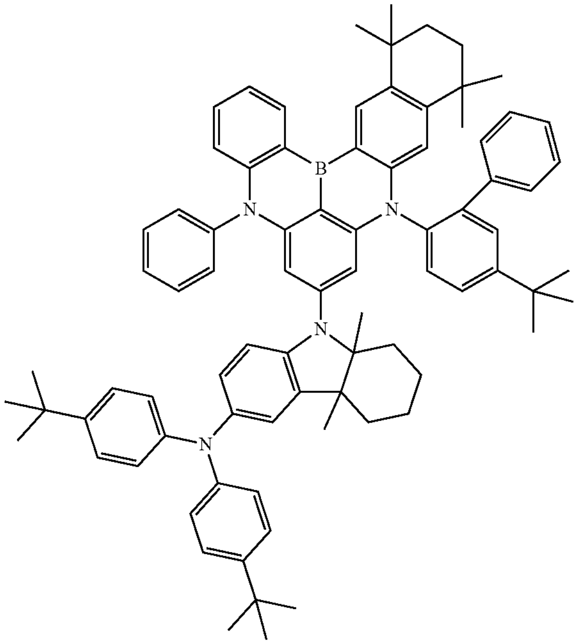
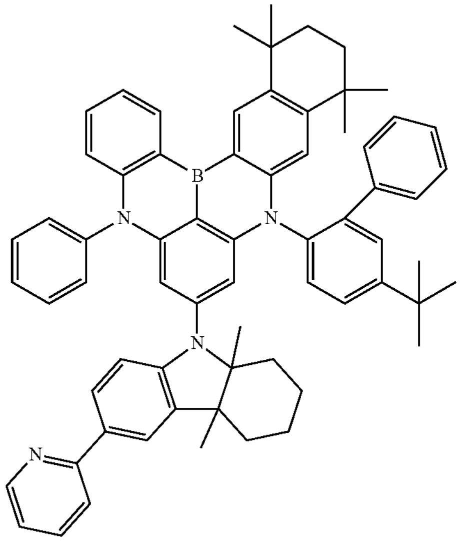

-continued
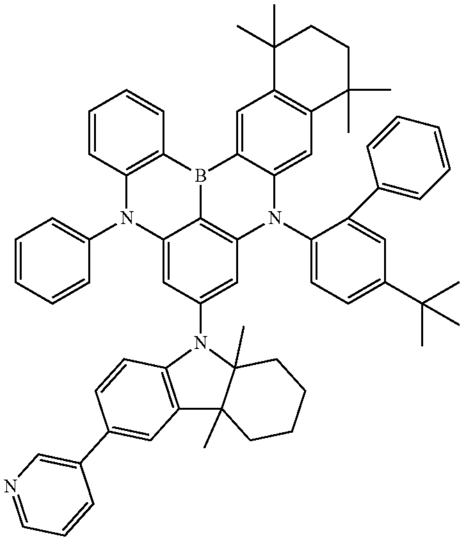
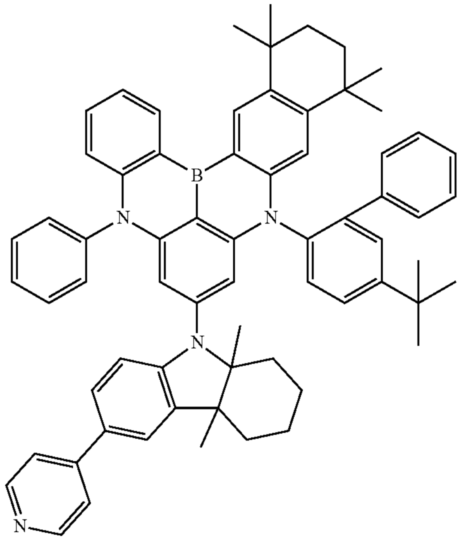
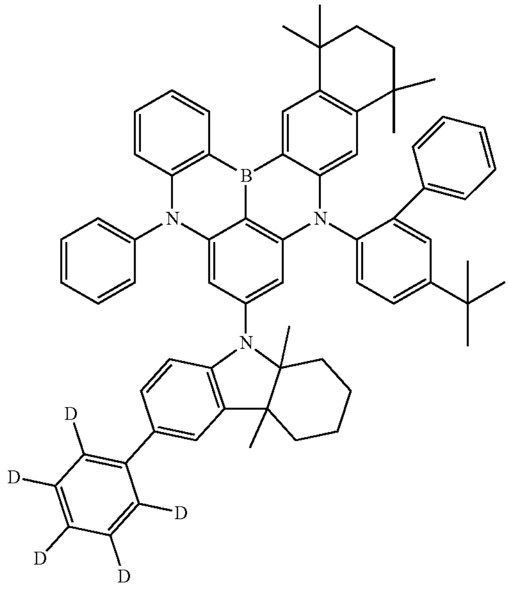
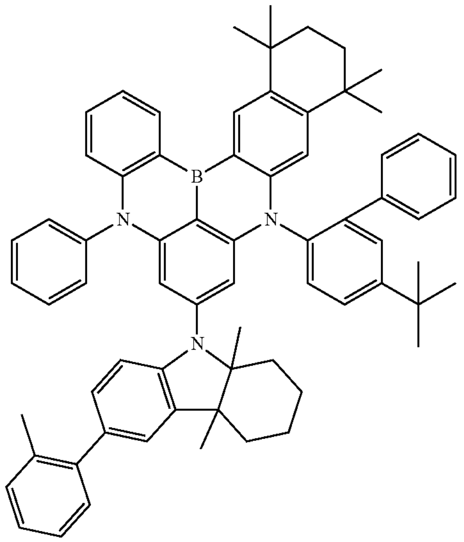
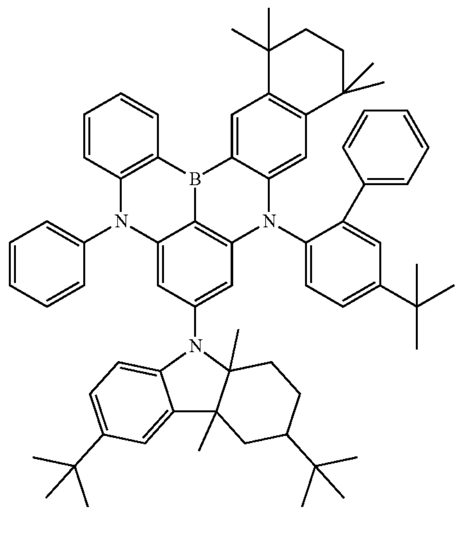
-continued
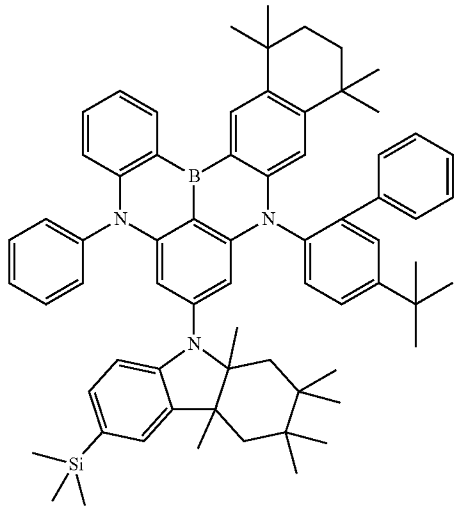

-continued
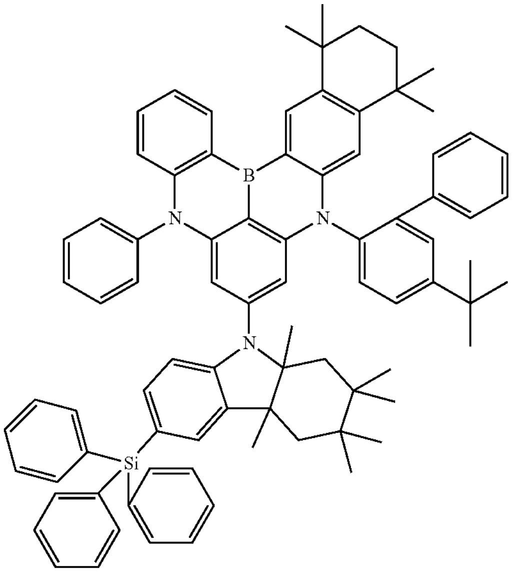
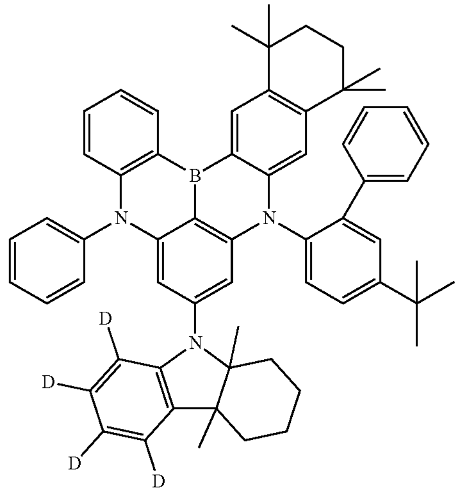
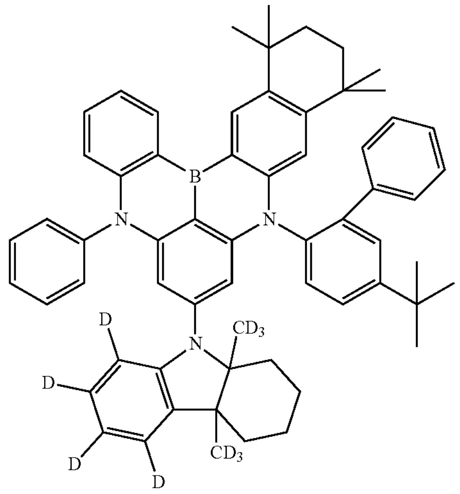
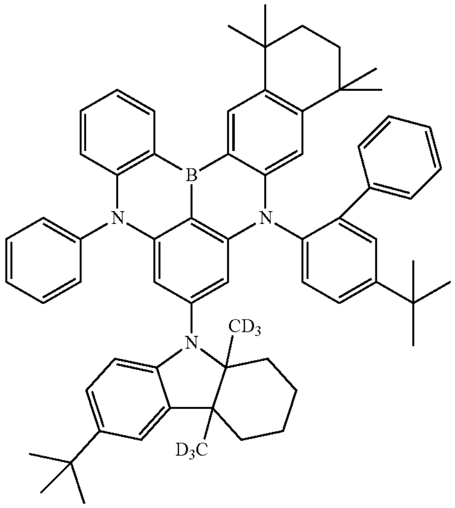
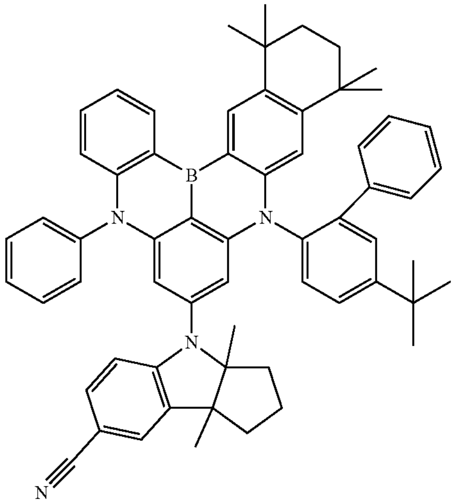
-continued
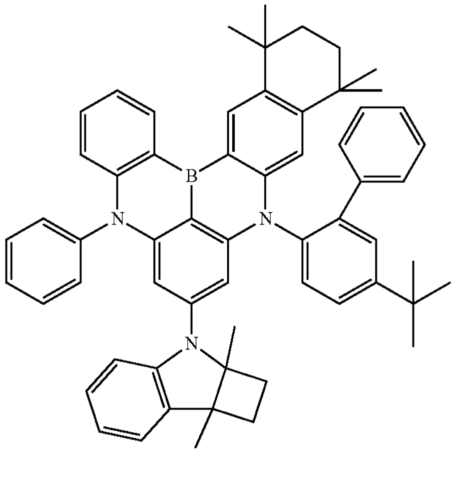

-continued
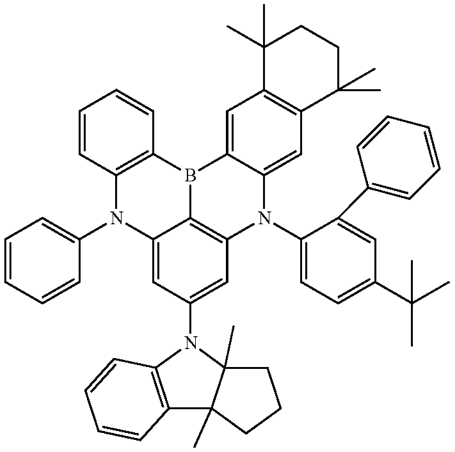
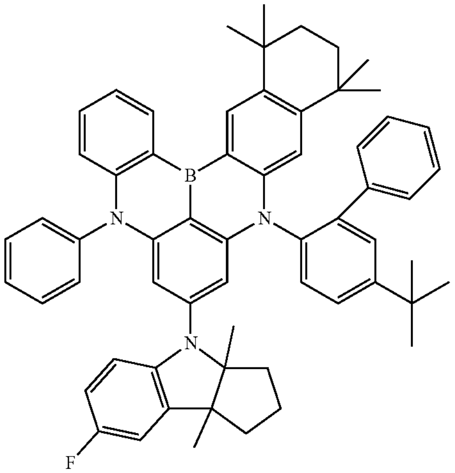
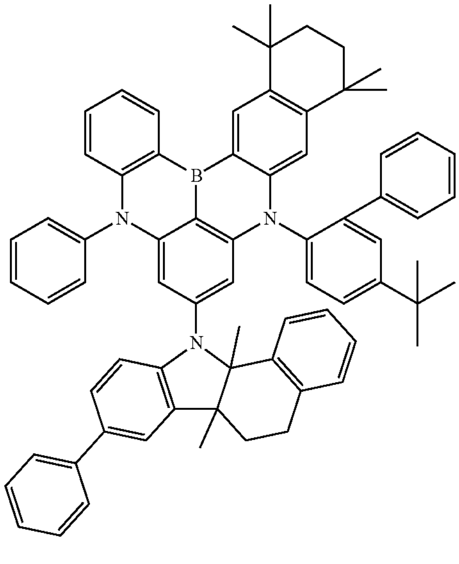
-continued
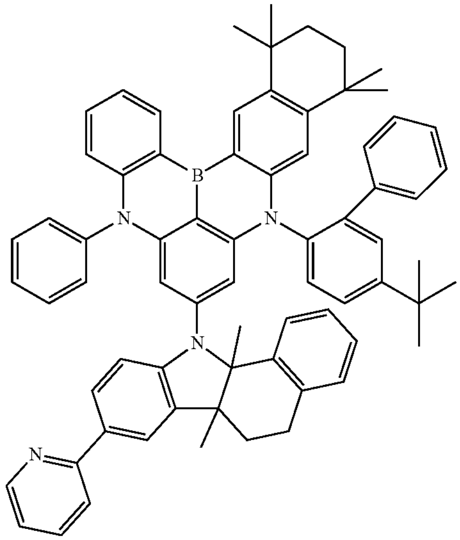
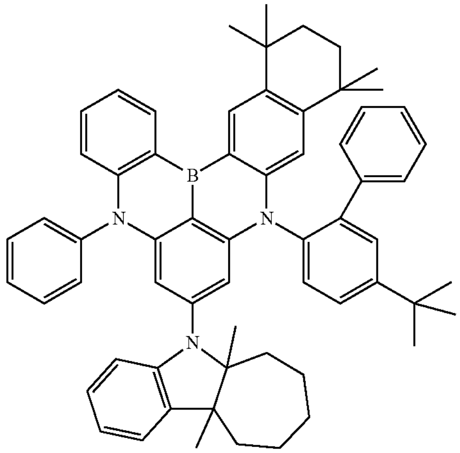
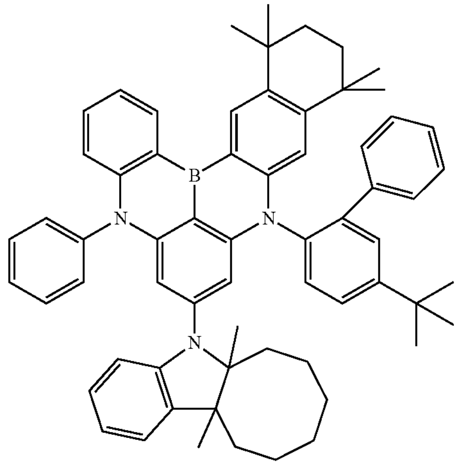

-continued
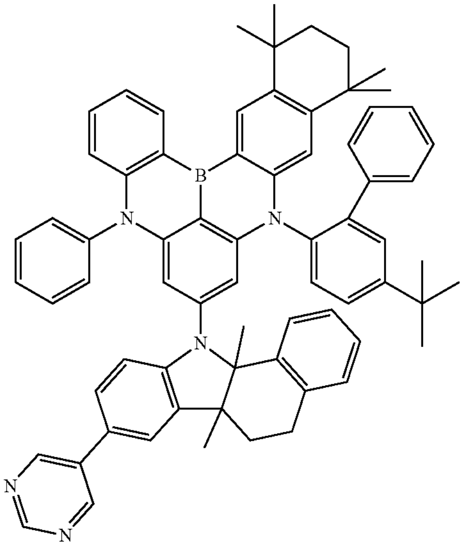
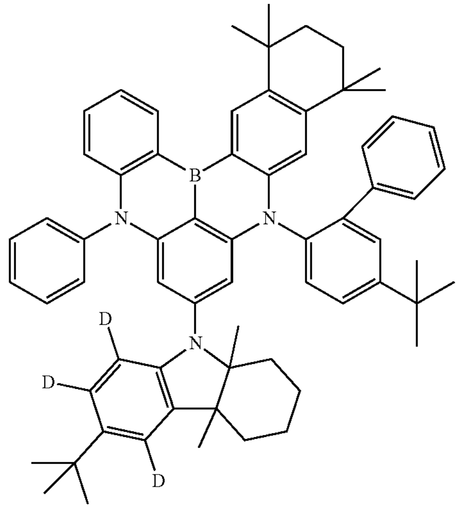
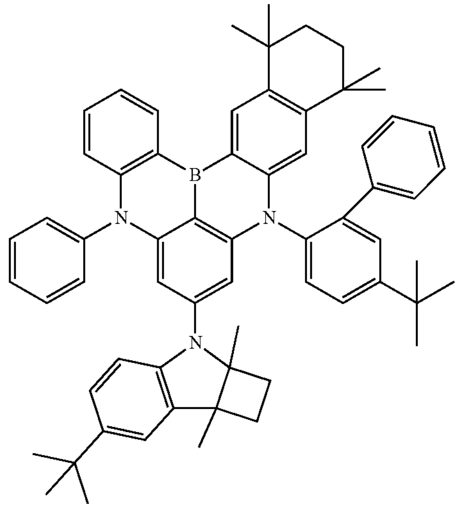
-continued
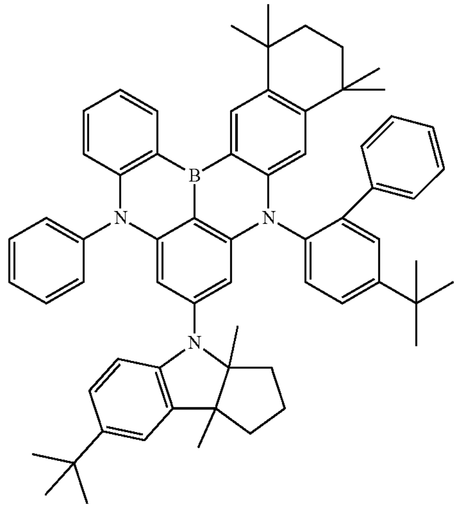
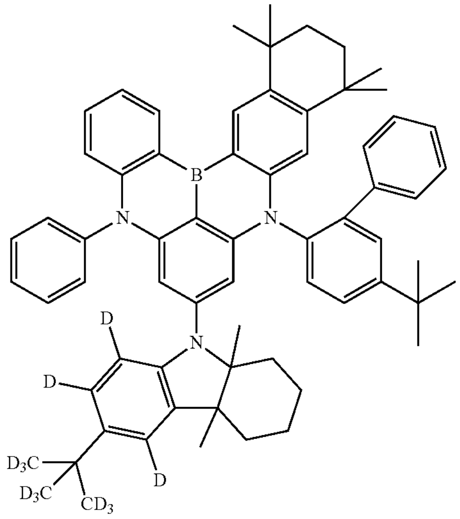
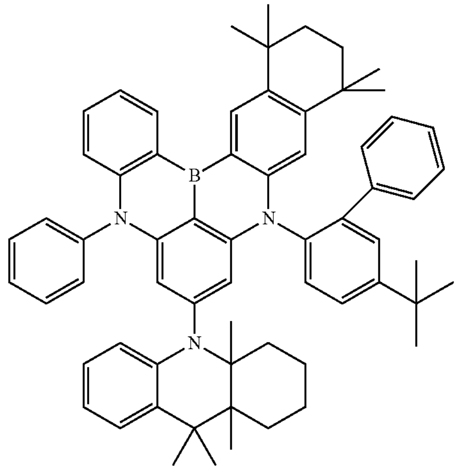

-continued
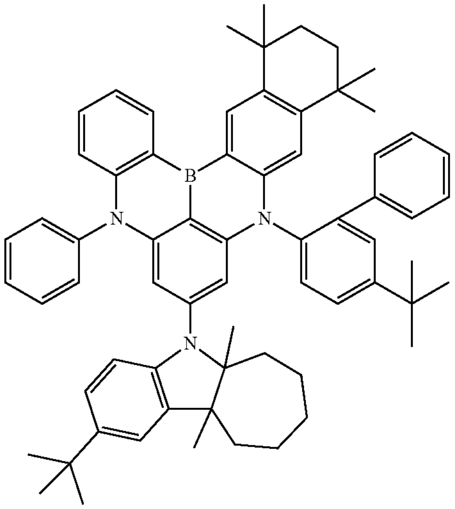
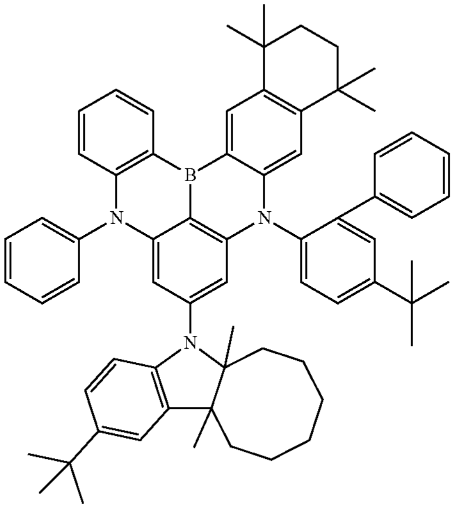
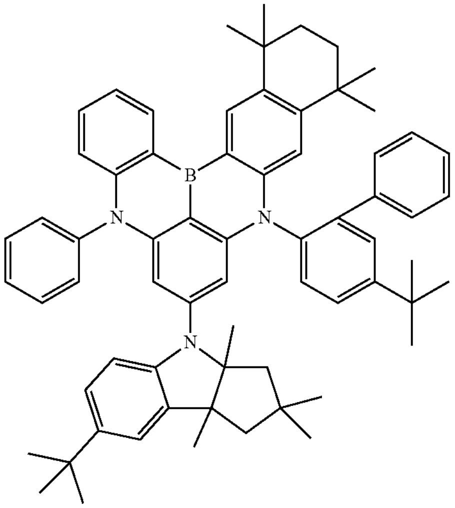
-continued
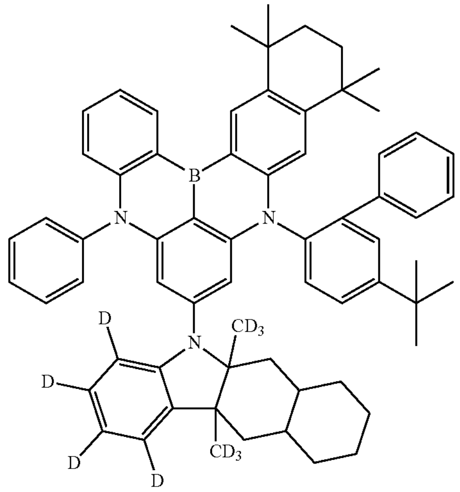
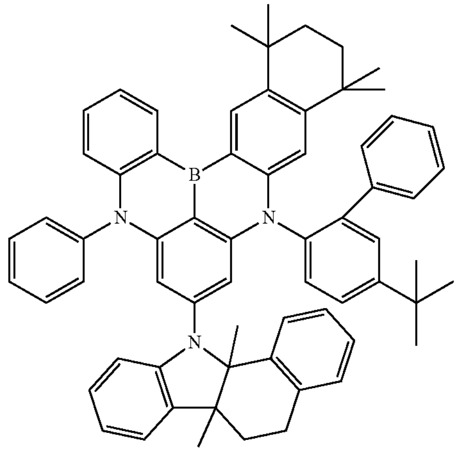
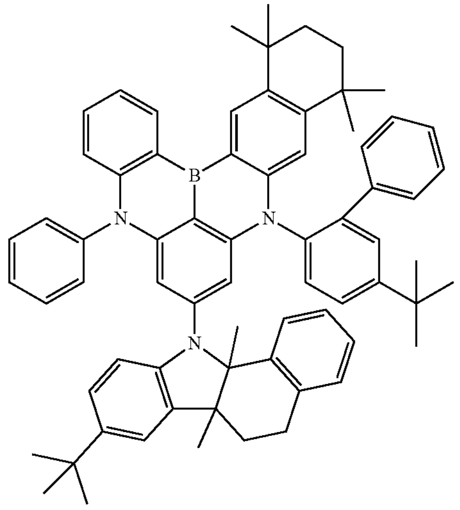

-continued
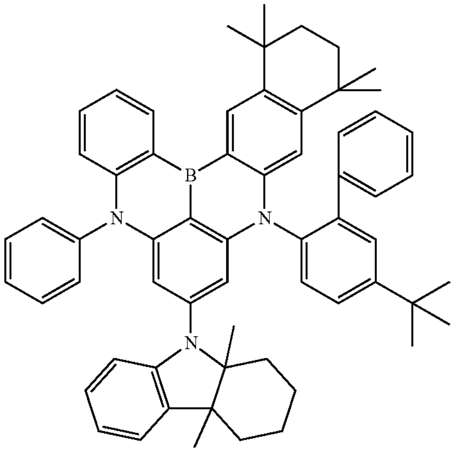
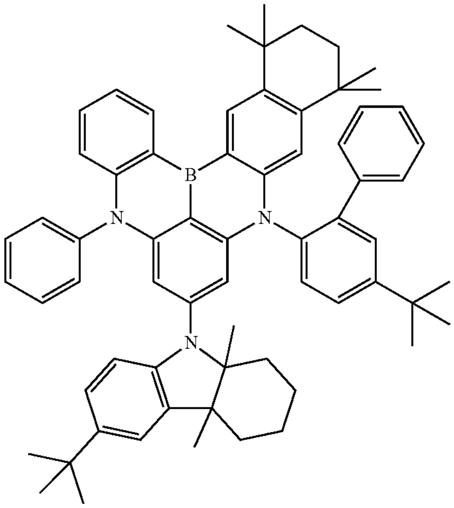
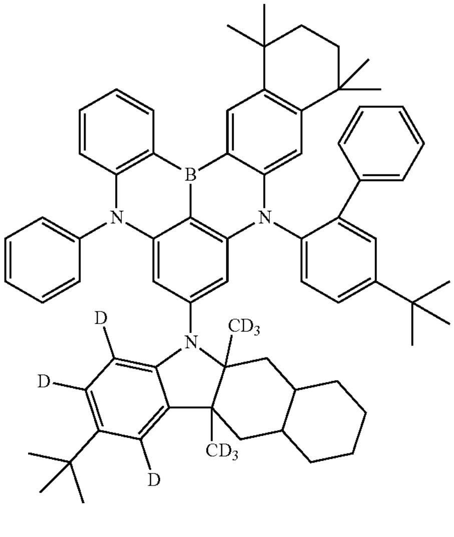
-continued
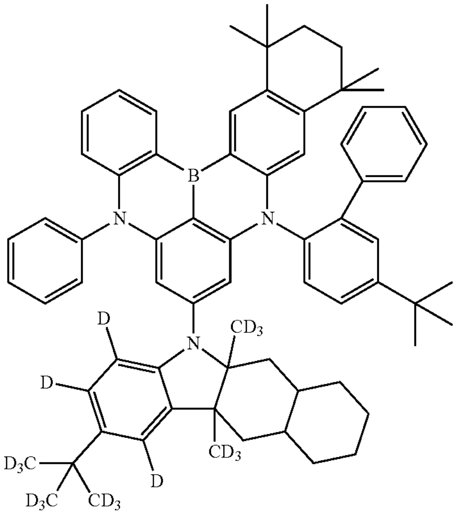
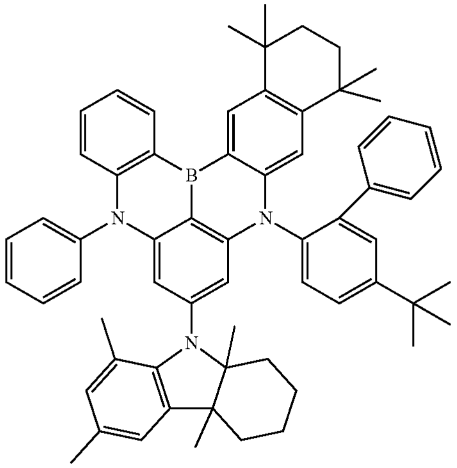
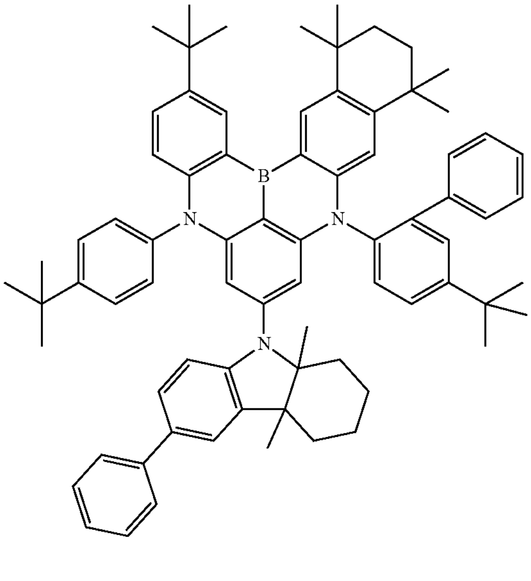

-continued
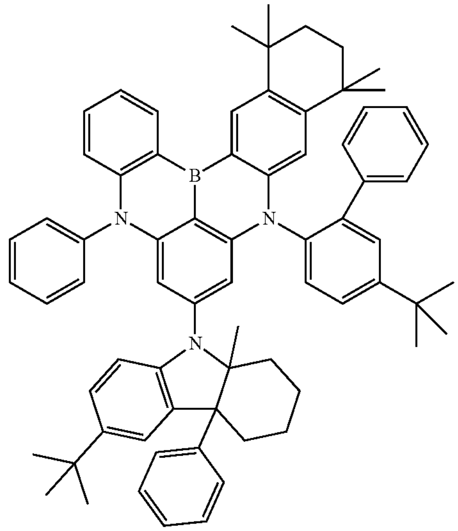
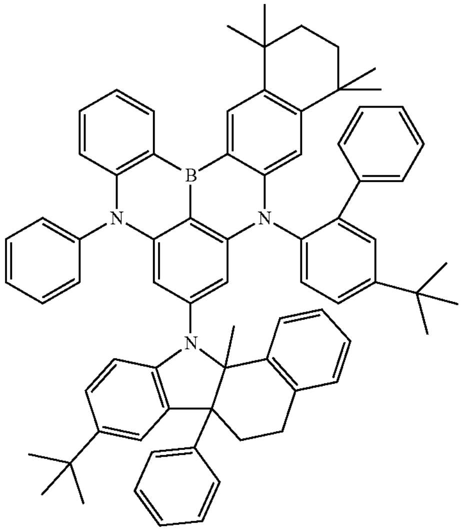
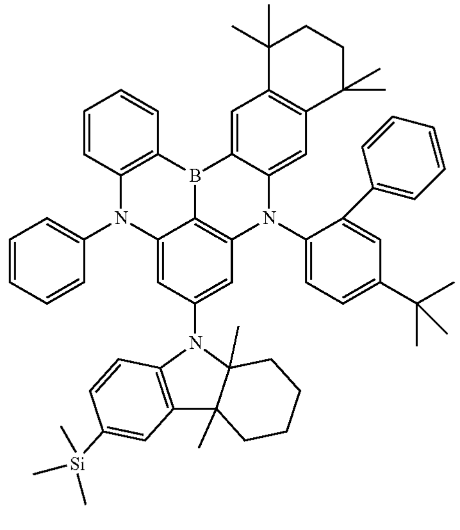
-continued
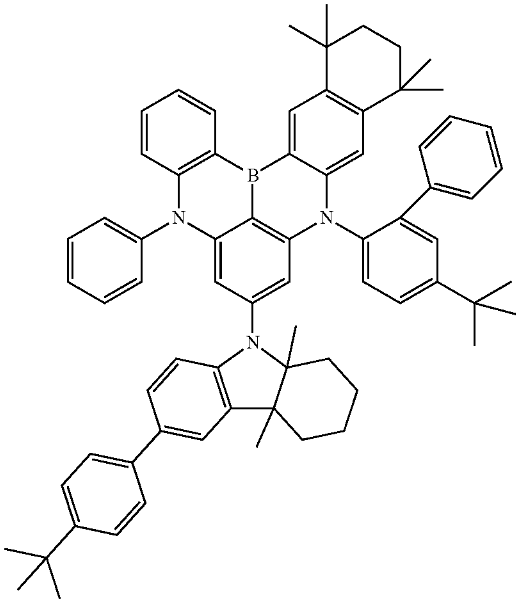
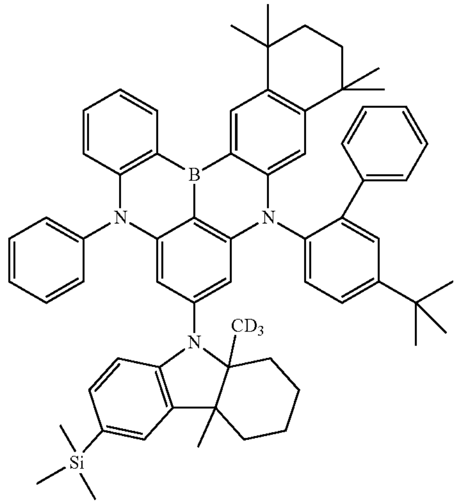
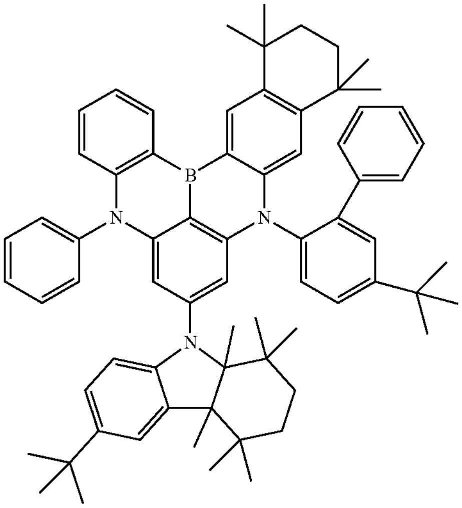

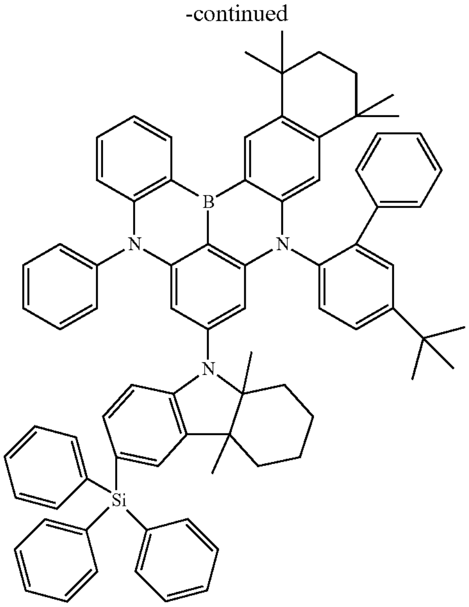
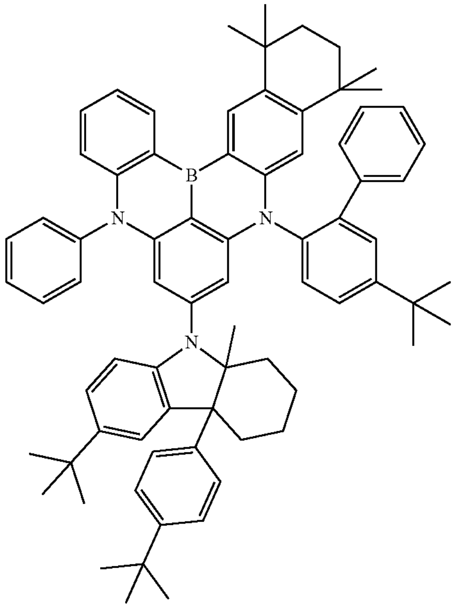
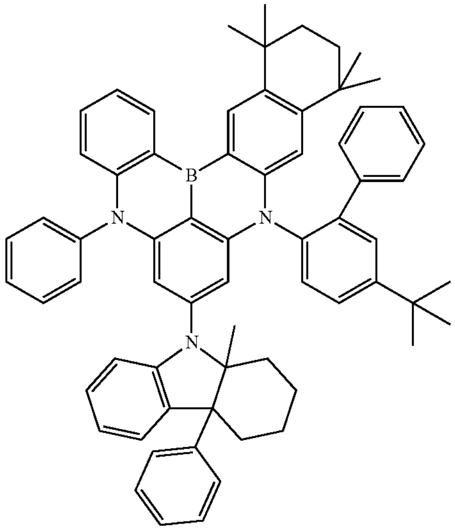
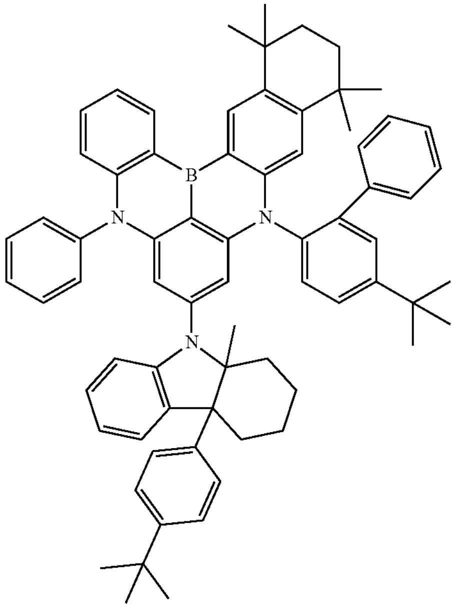
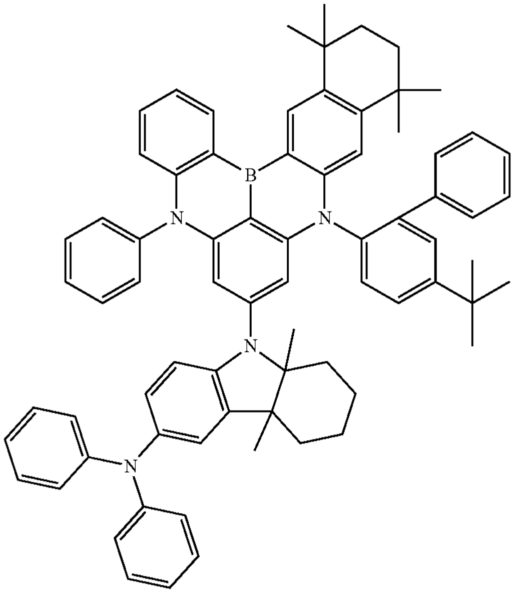

-continued
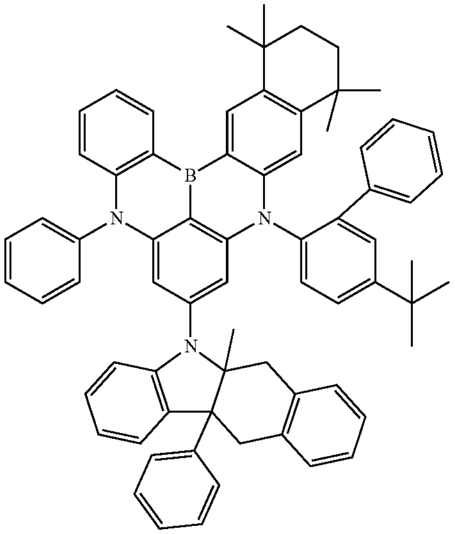
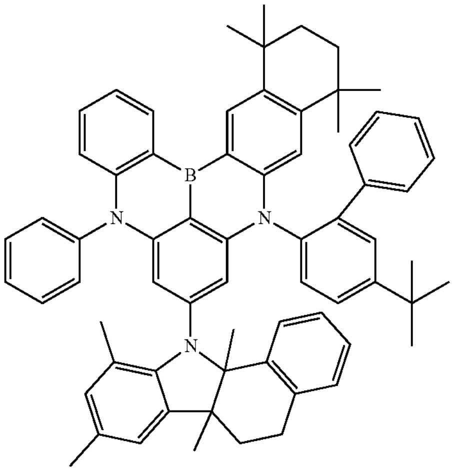
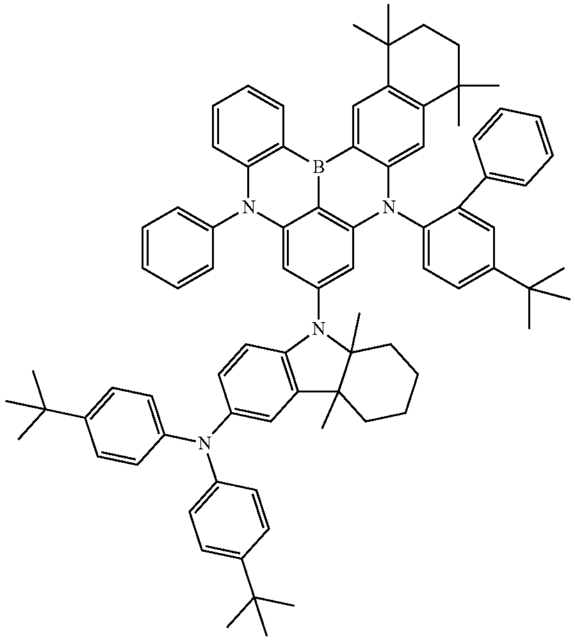
-continued
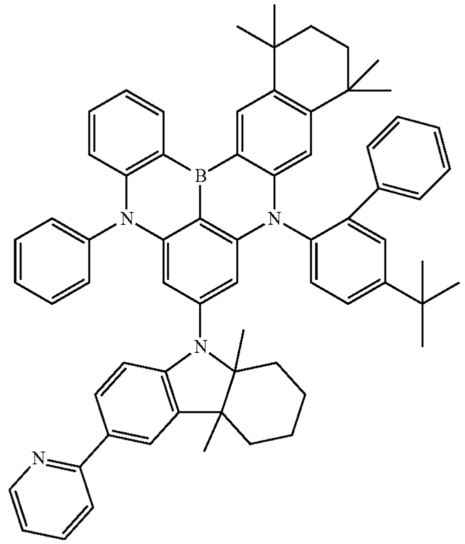
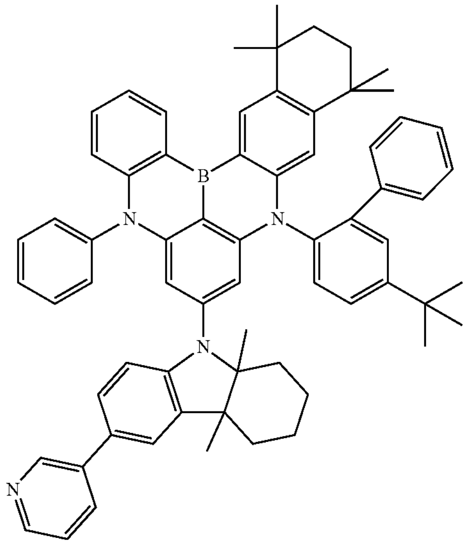
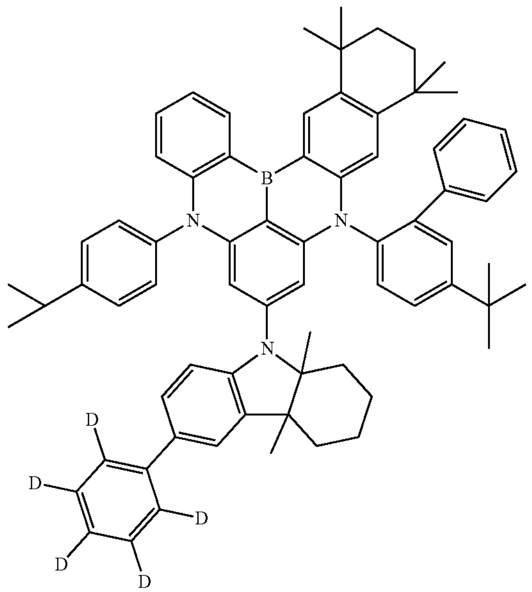

-continued
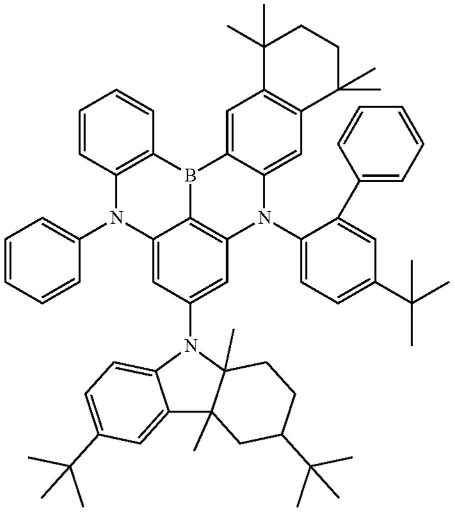
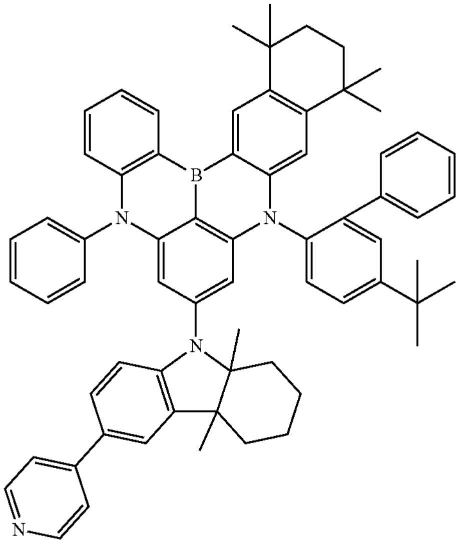
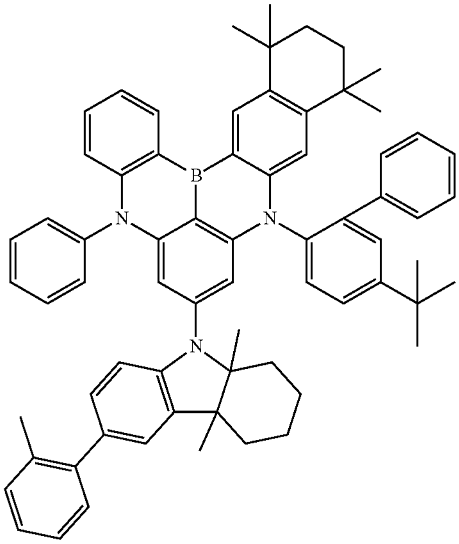
-continued
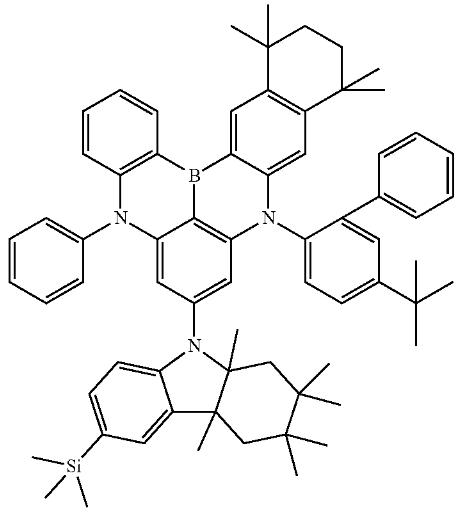
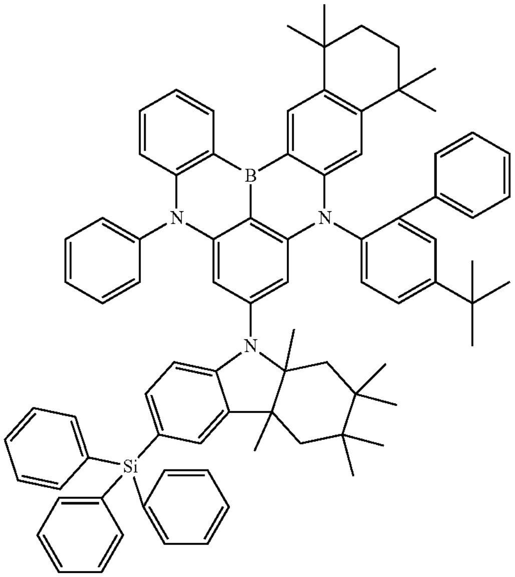
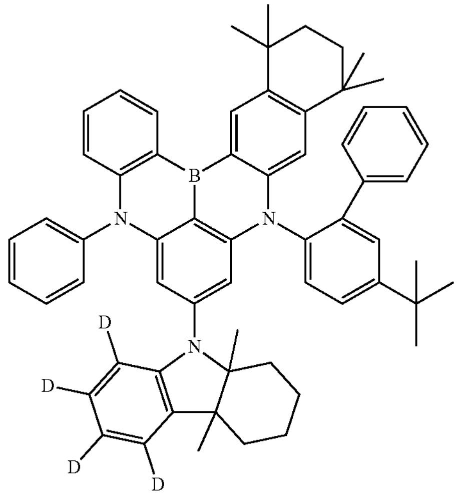

-continued
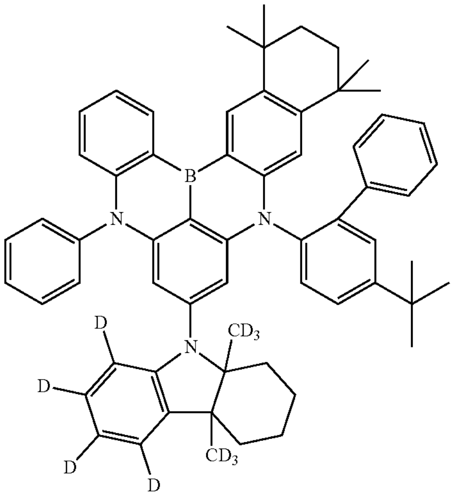
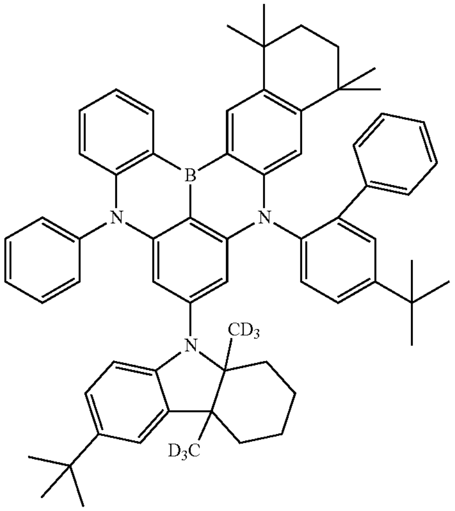
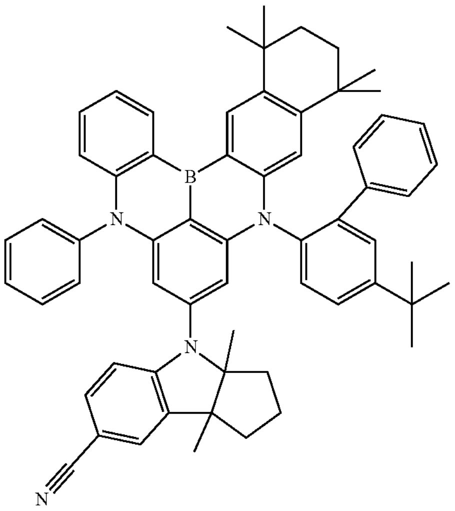
-continued
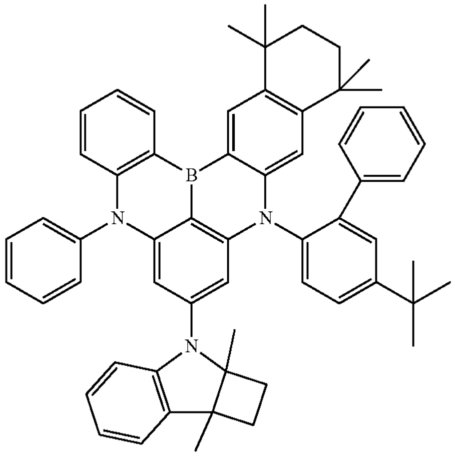
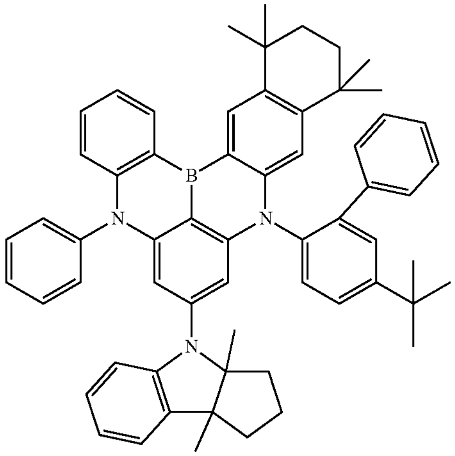
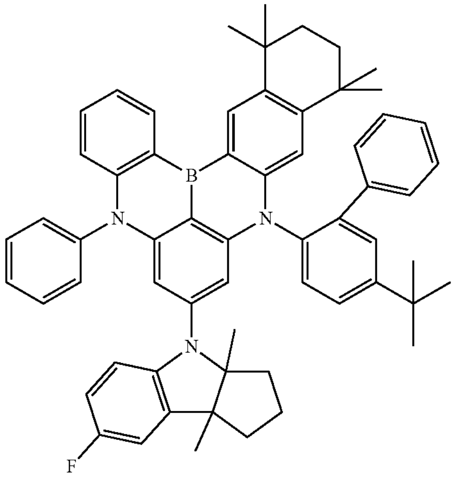

-continued
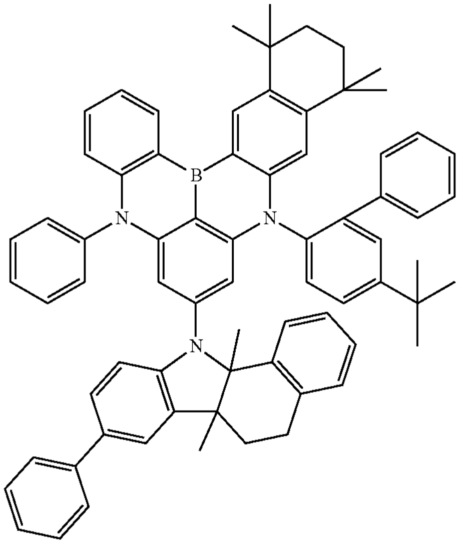
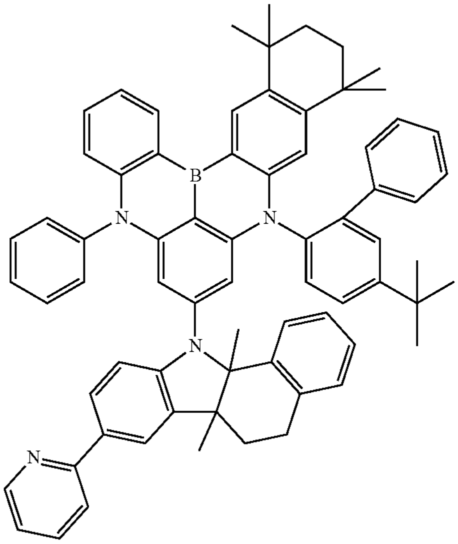
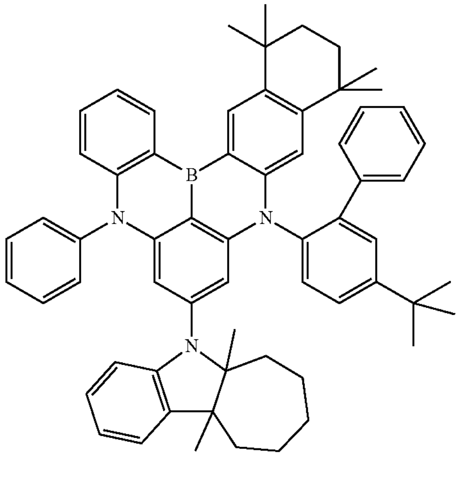
-continued
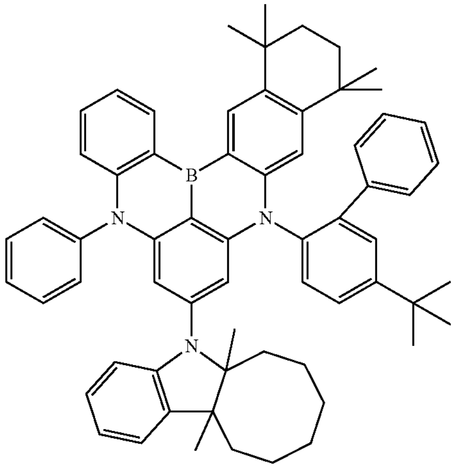
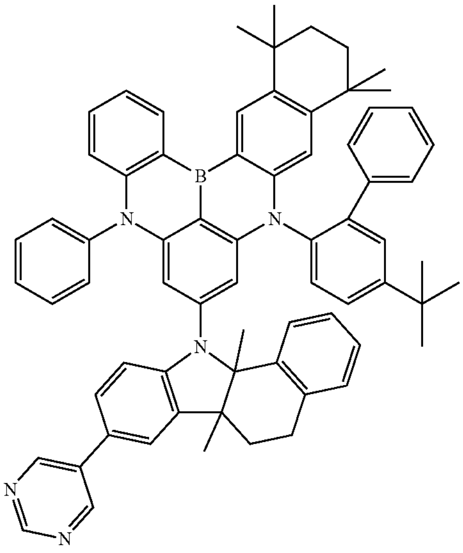
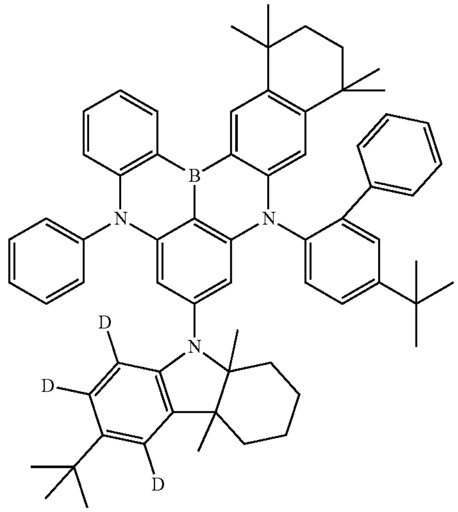

-continued
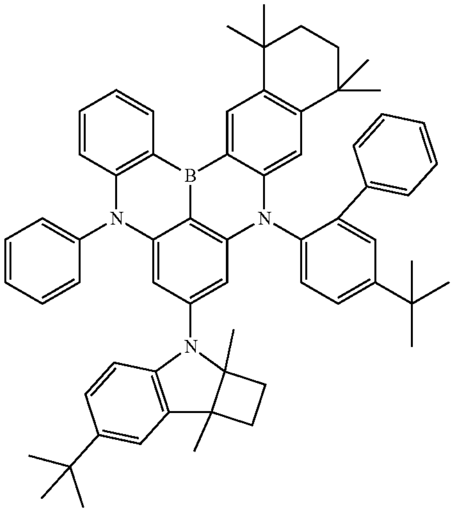
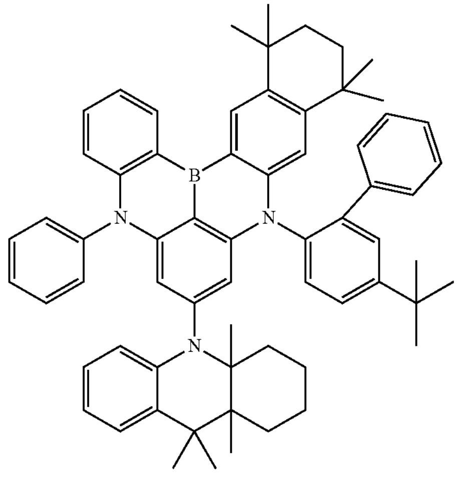
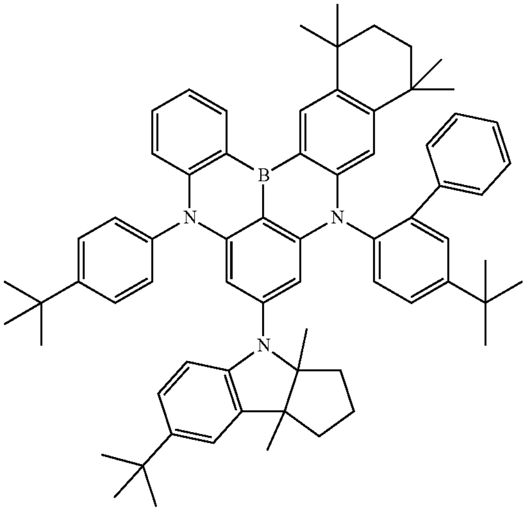
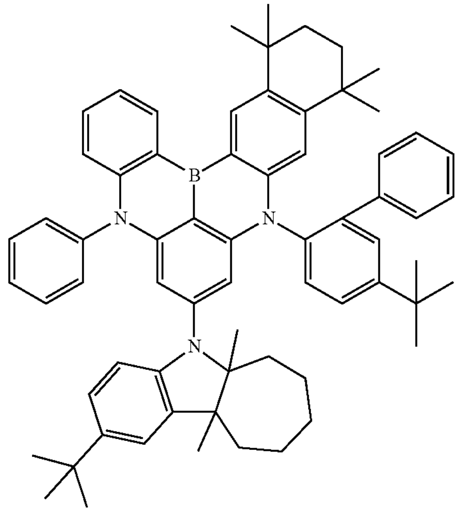
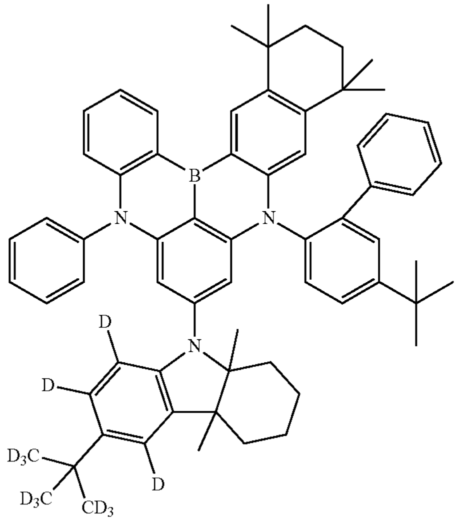
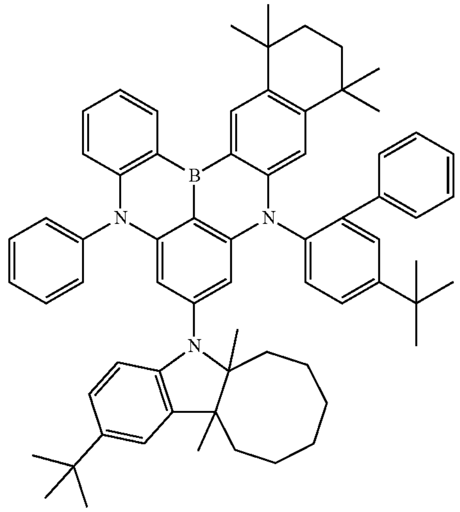
-continued -continued
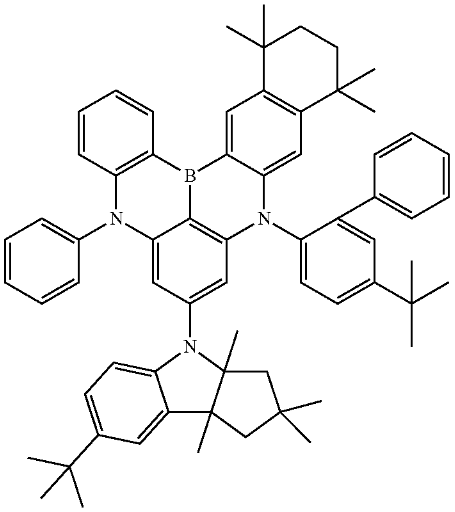
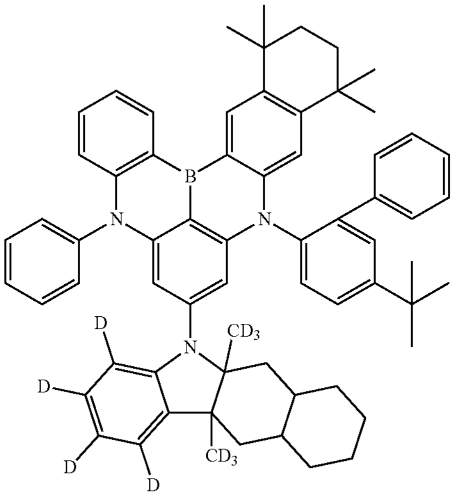
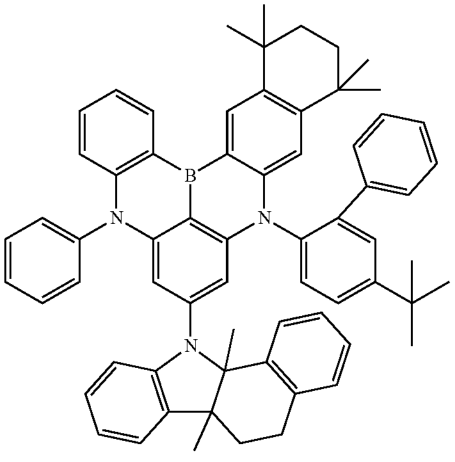
-continued
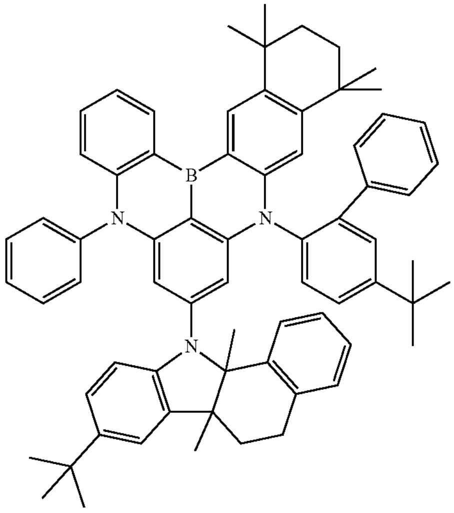
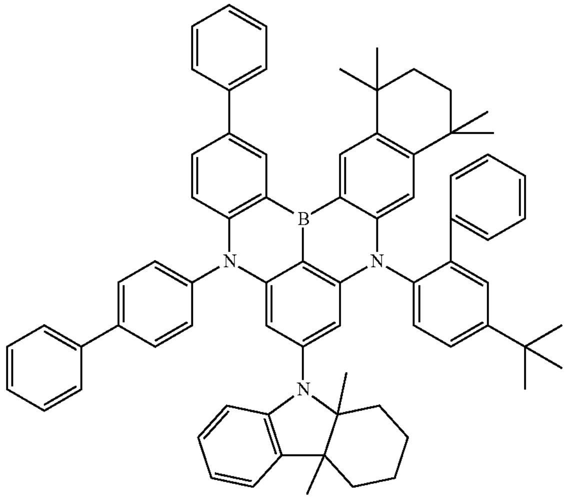
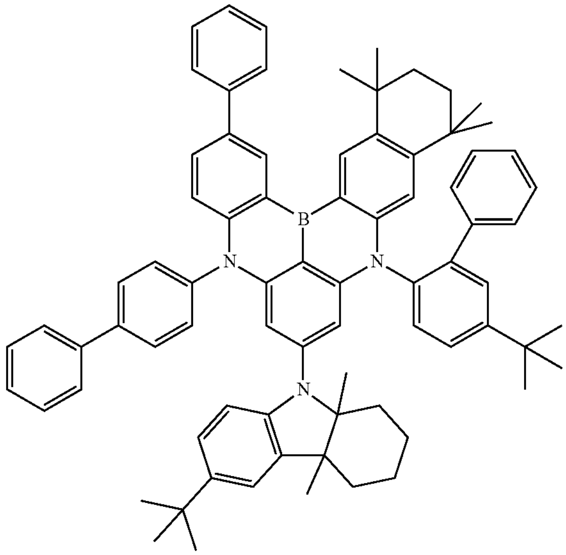

-continued
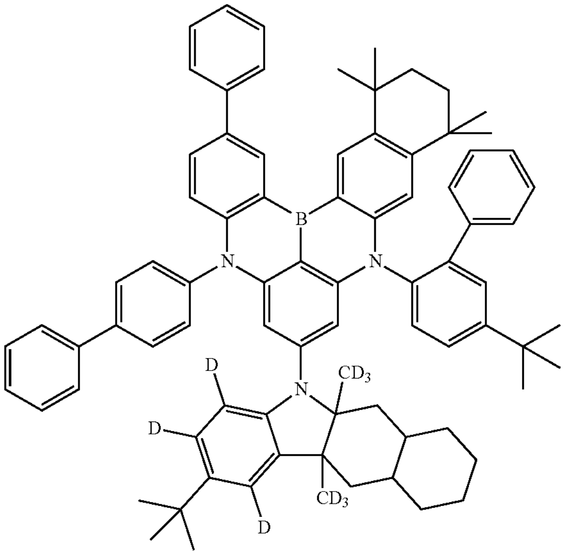
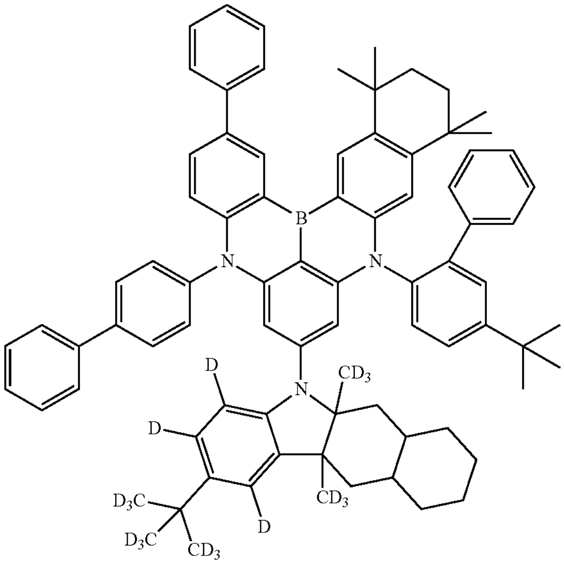
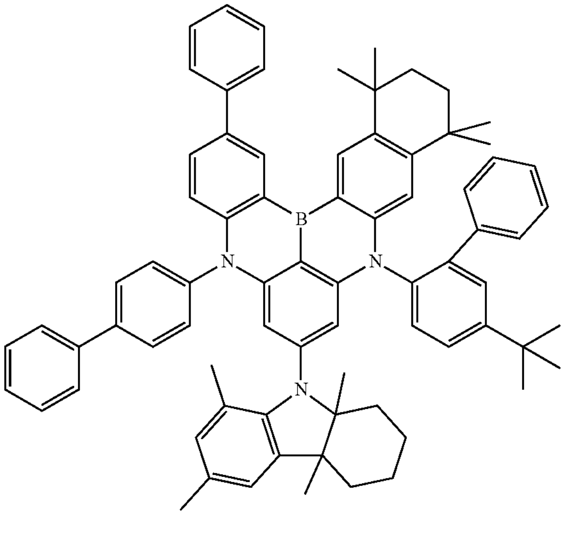
-continued
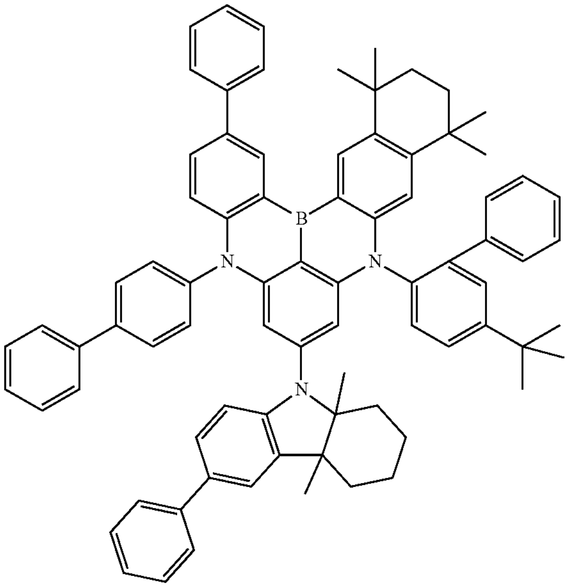
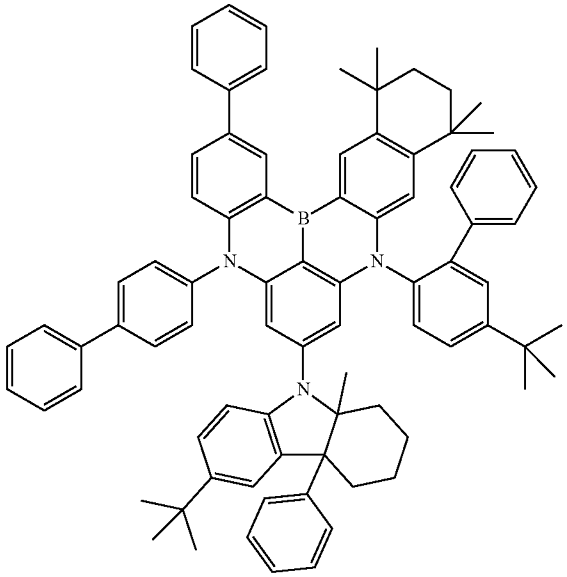

-continued
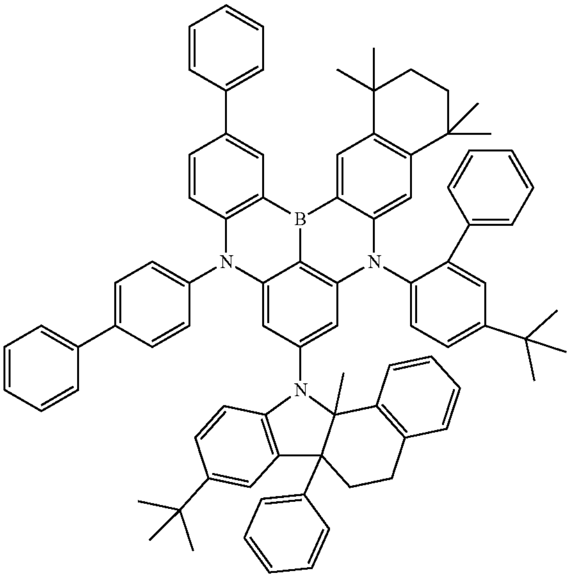
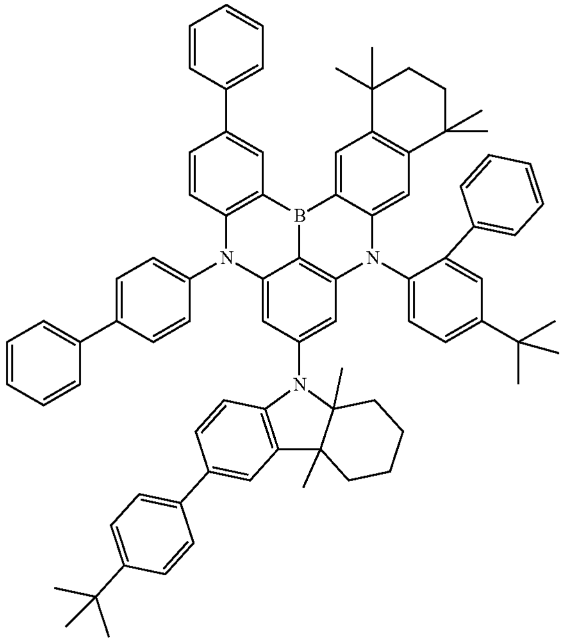
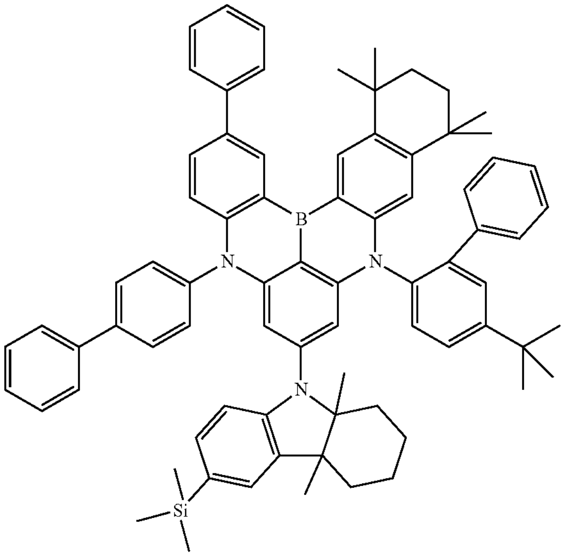
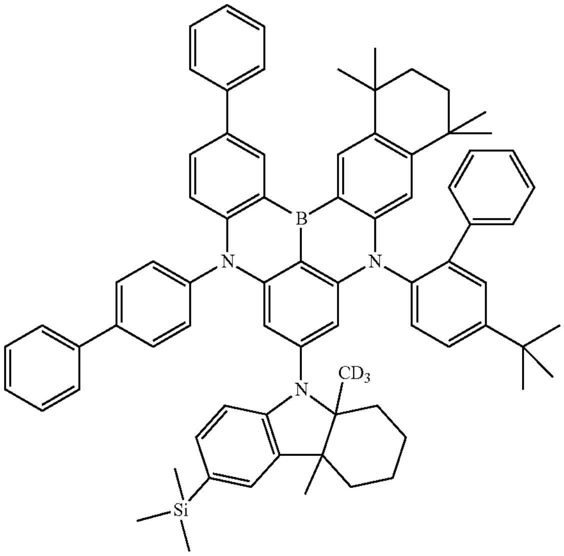

-continued
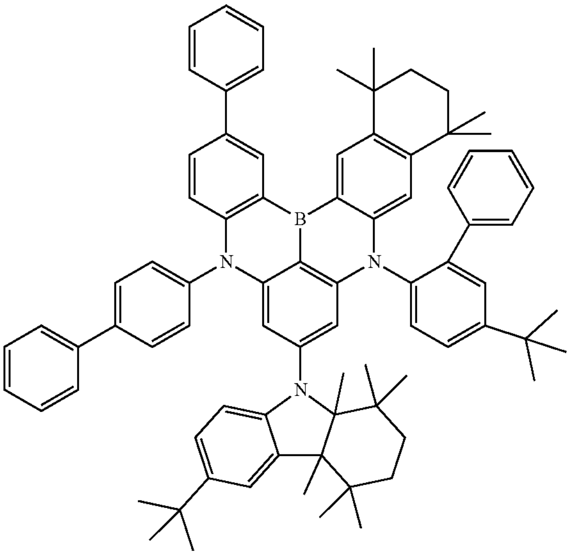
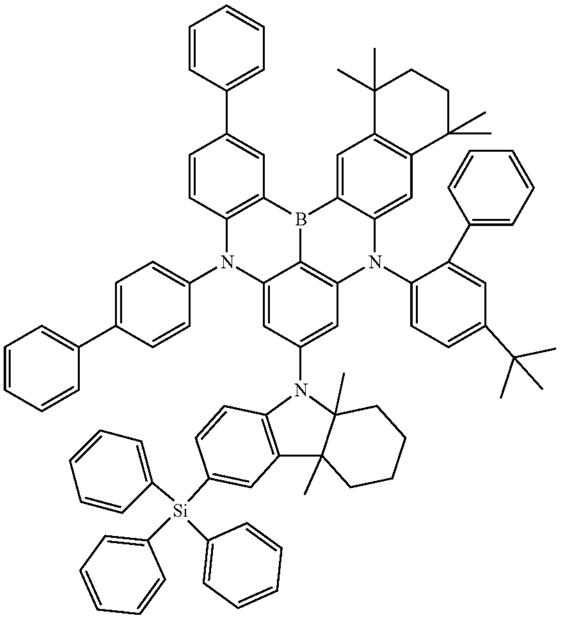
-continued
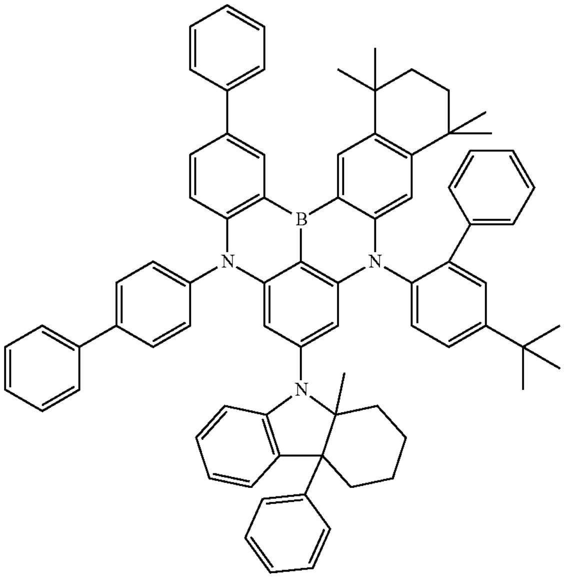
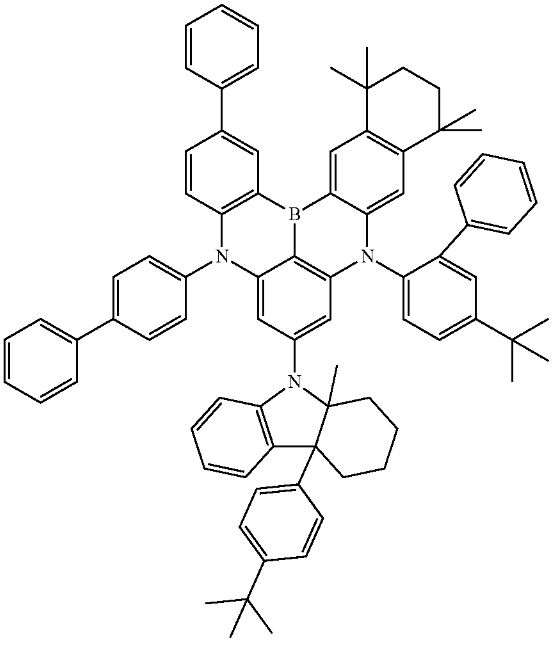

-continued
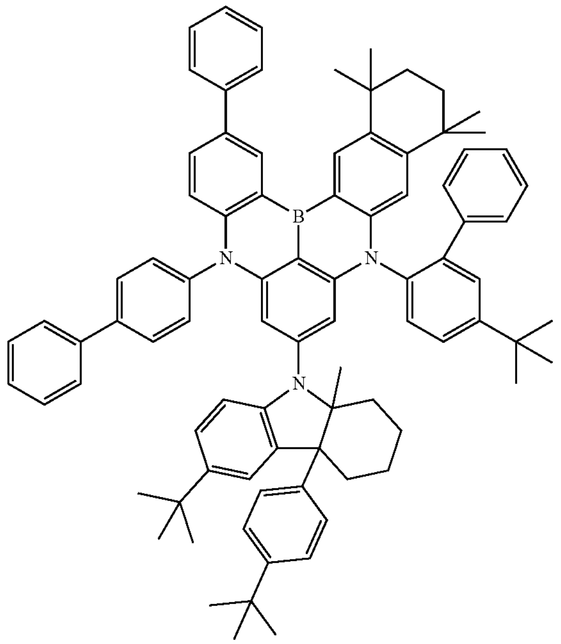
-continued
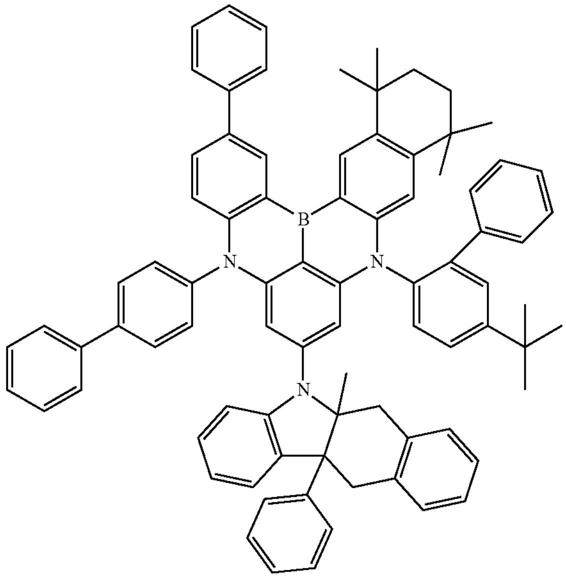
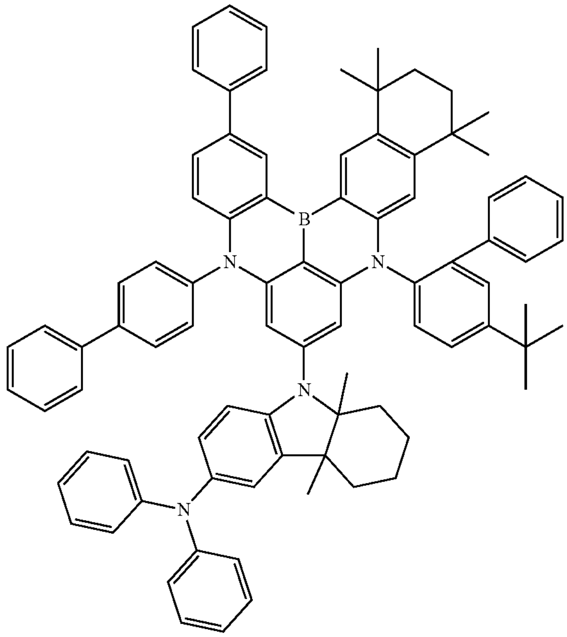
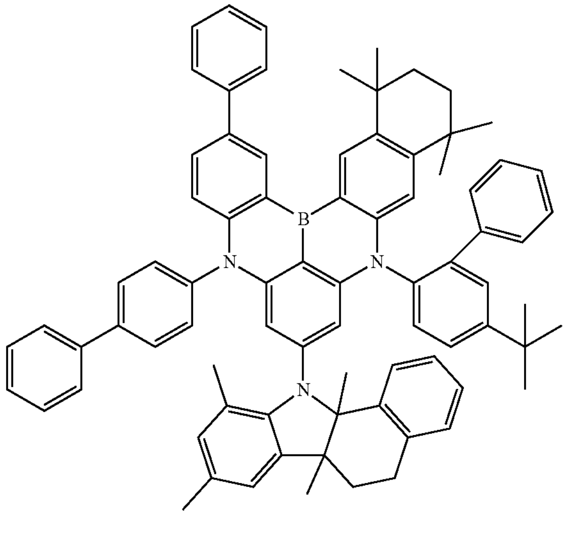

-continued
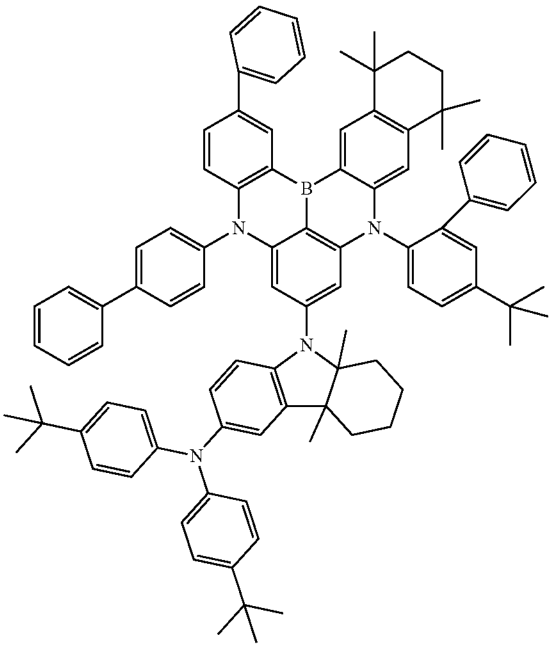
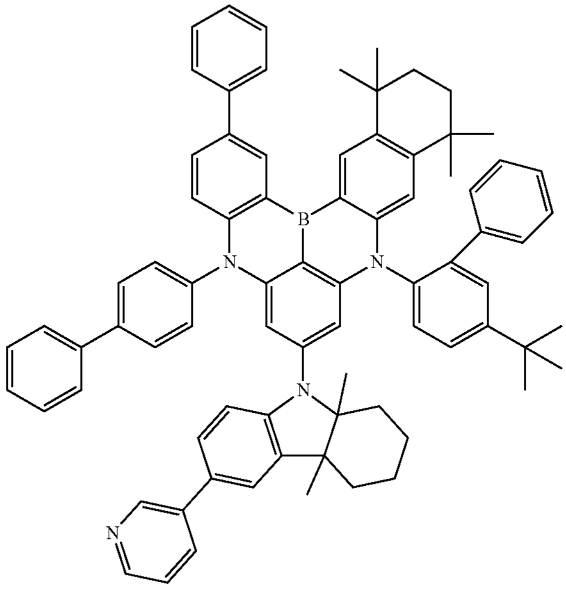
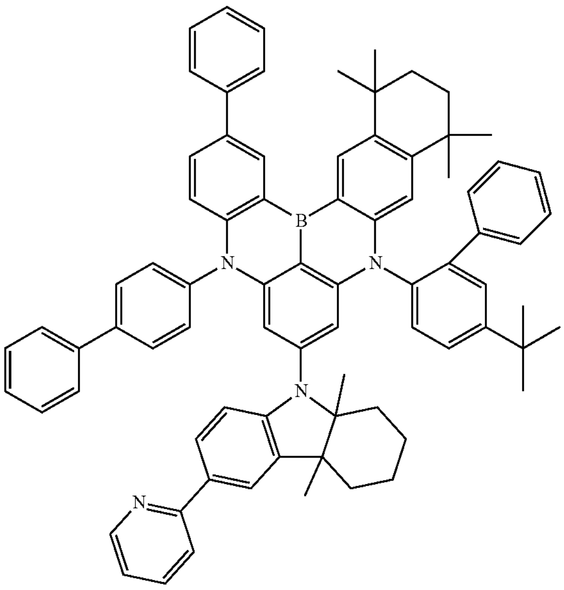
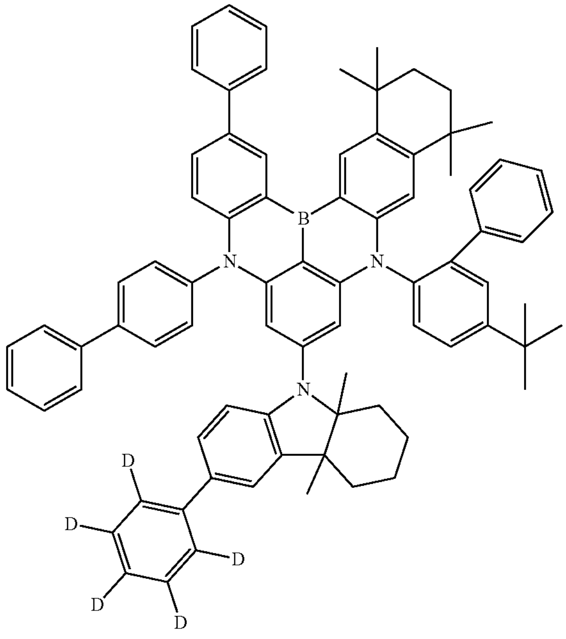

-continued
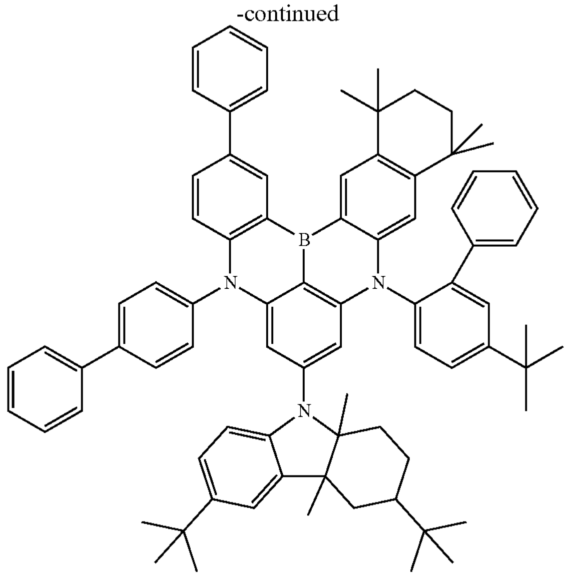
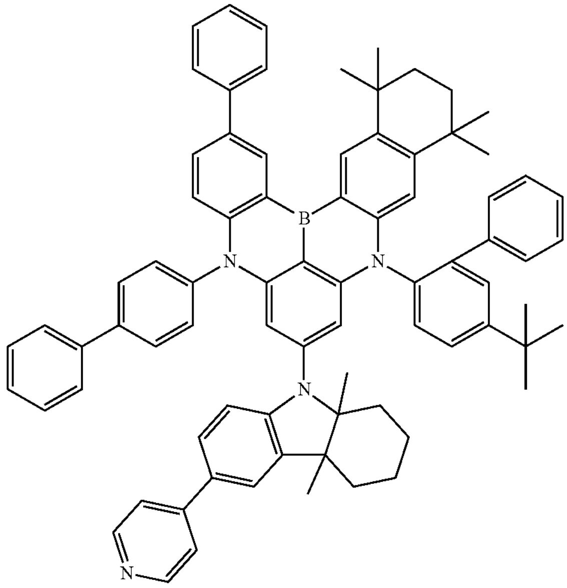
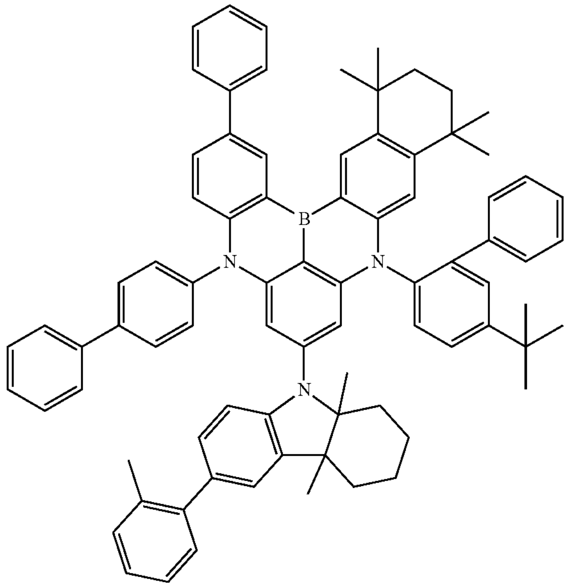
-continued
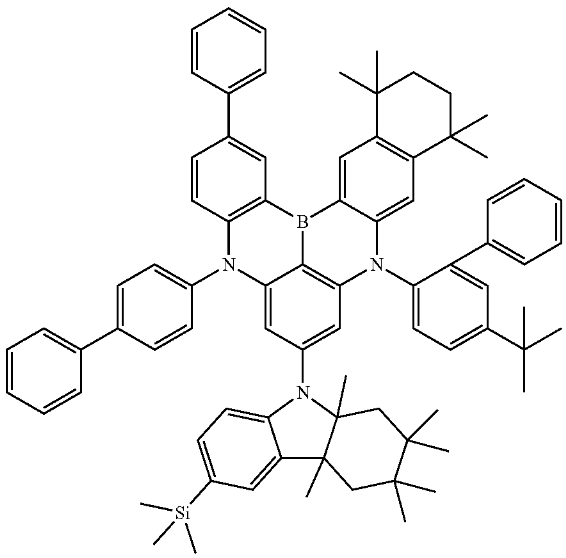
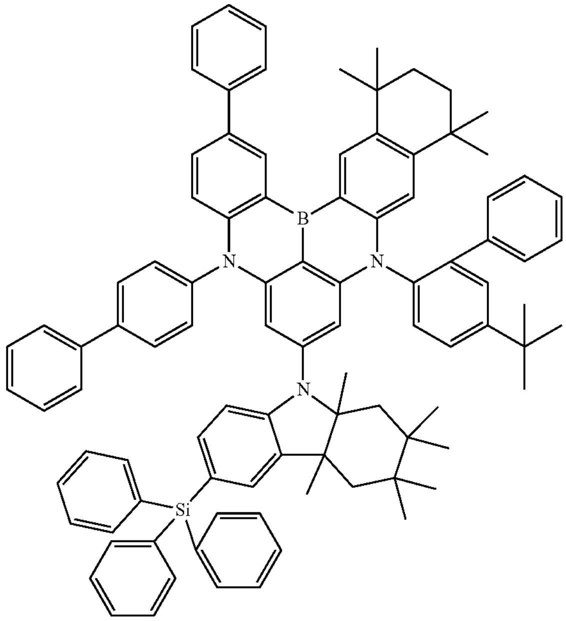
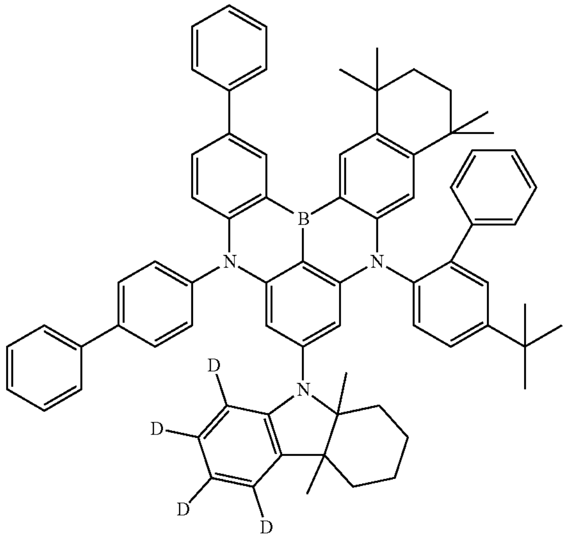

-continued
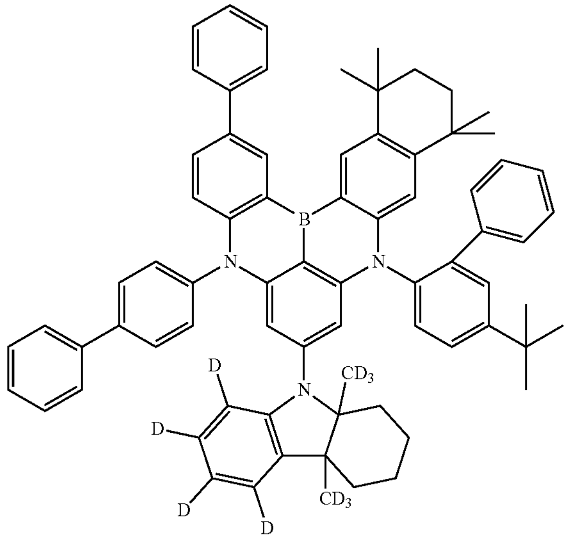
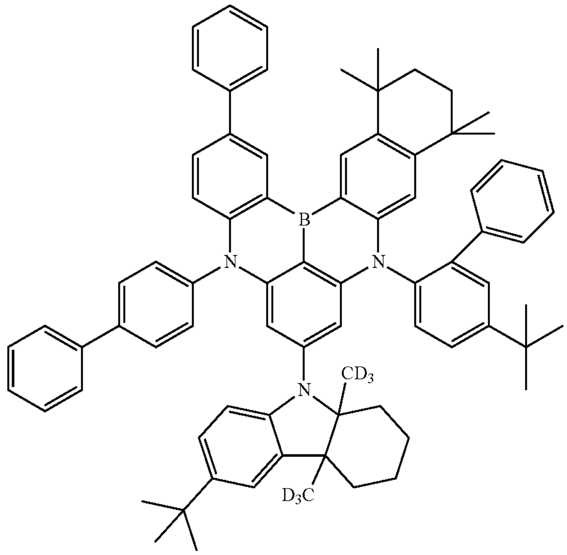
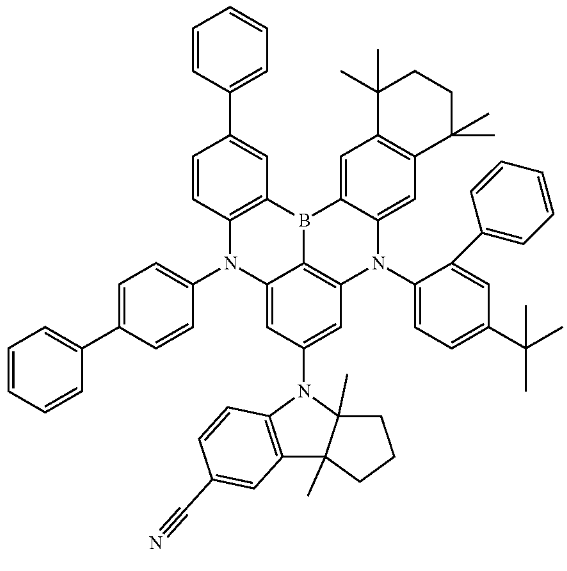
-continued
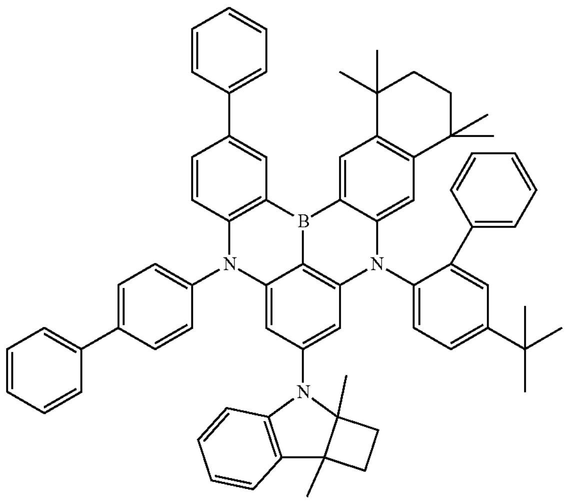
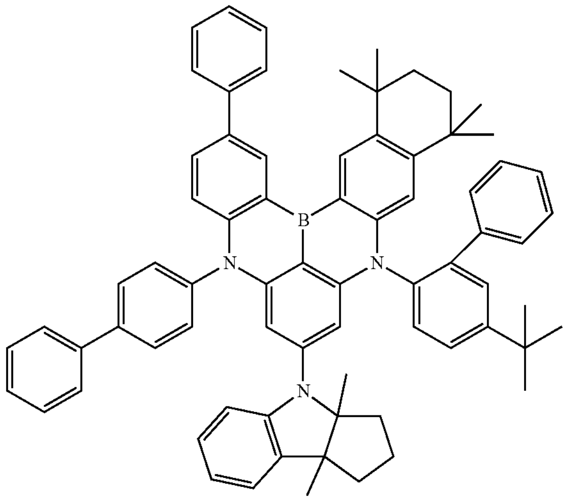
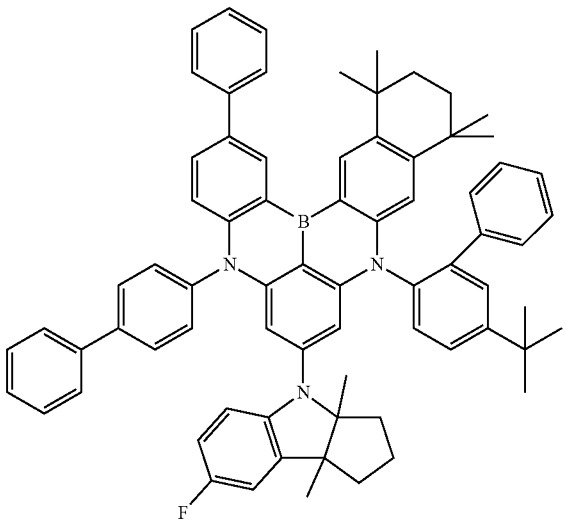

-continued
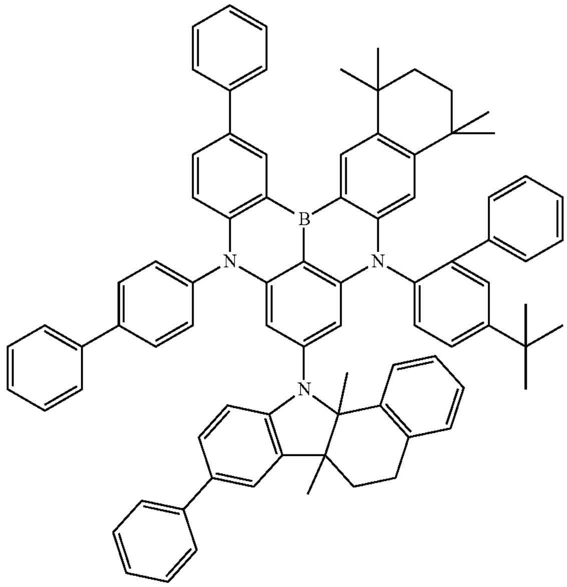
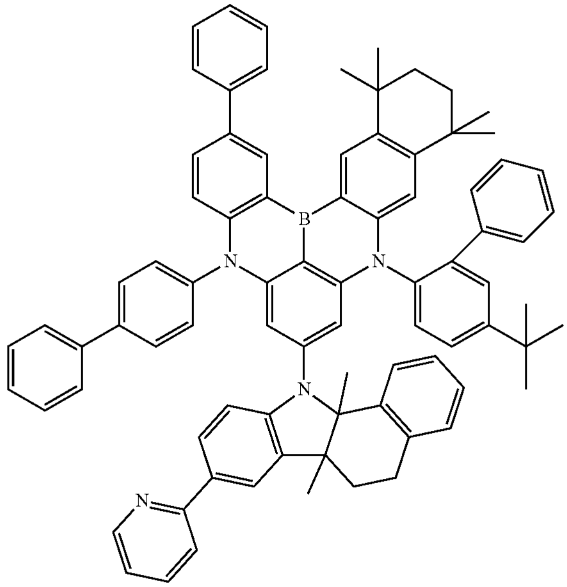
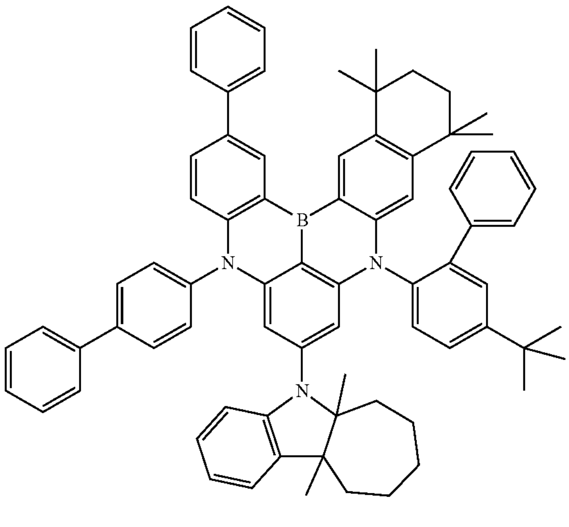
-continued
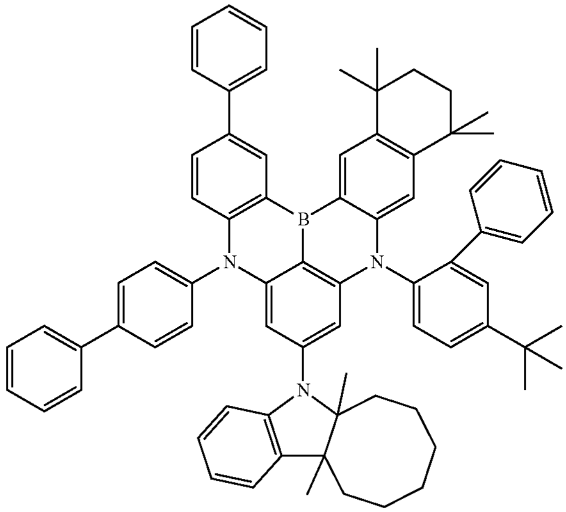
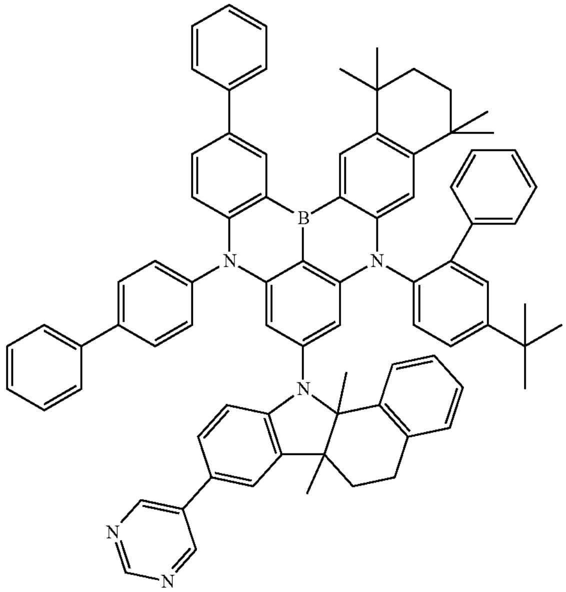
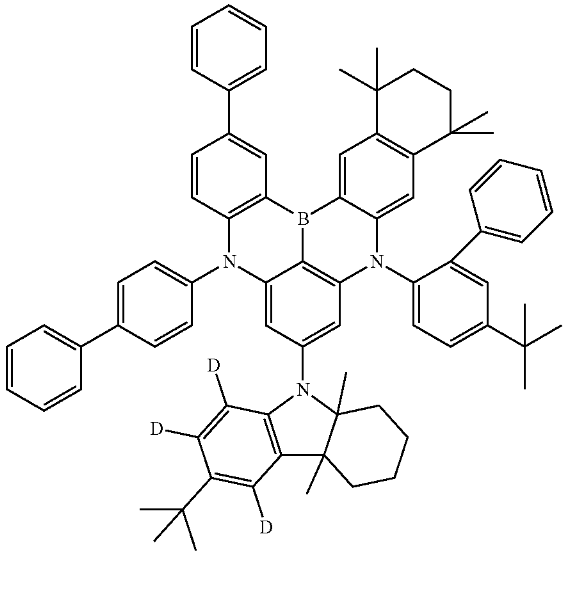

-continued
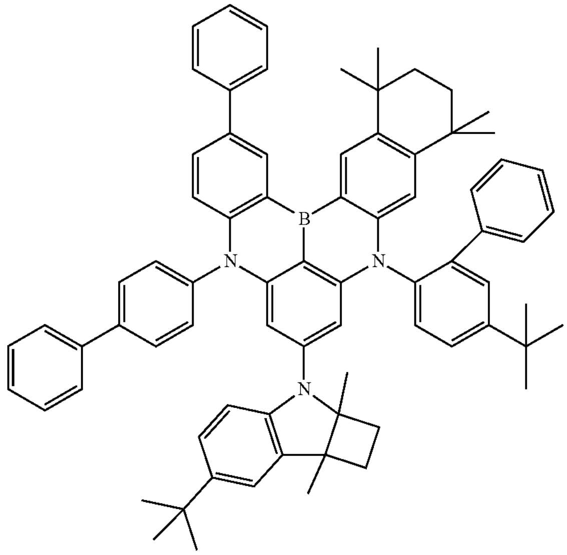
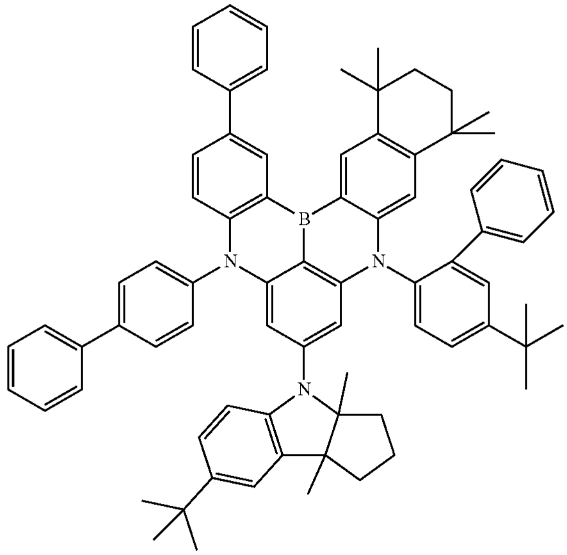
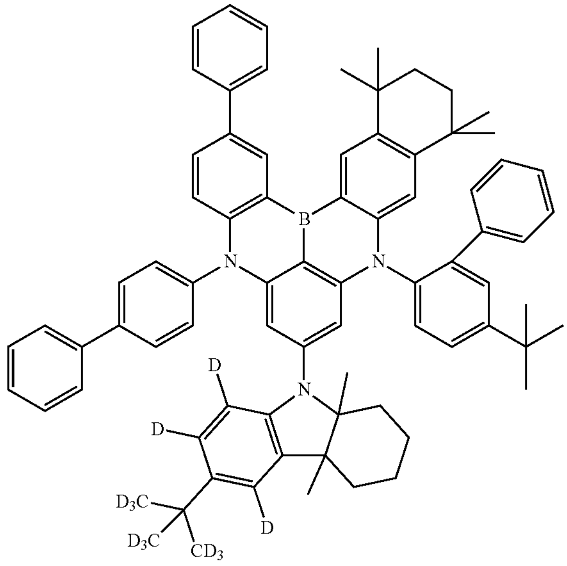
-continued
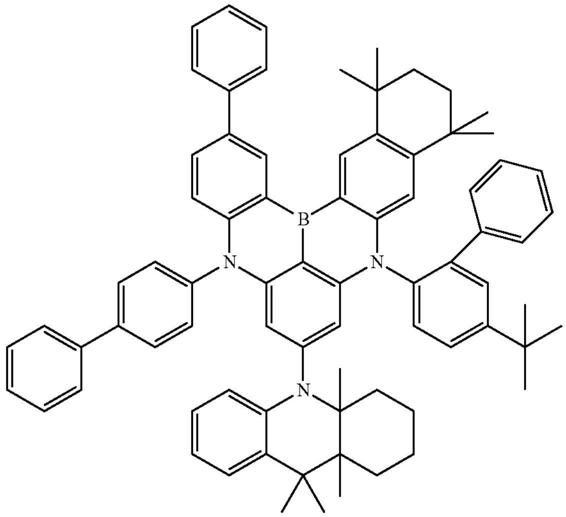
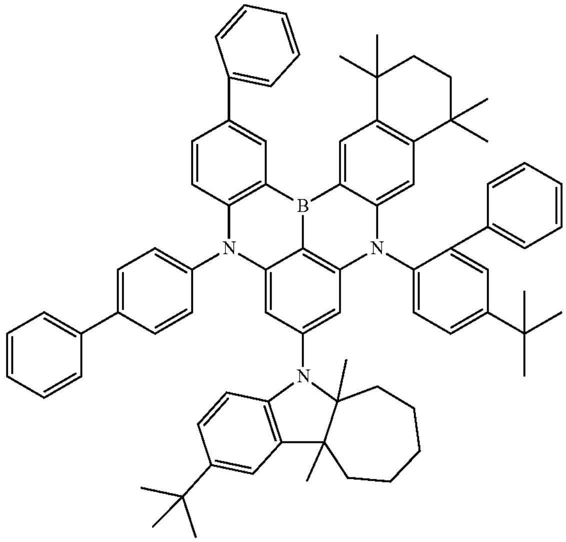
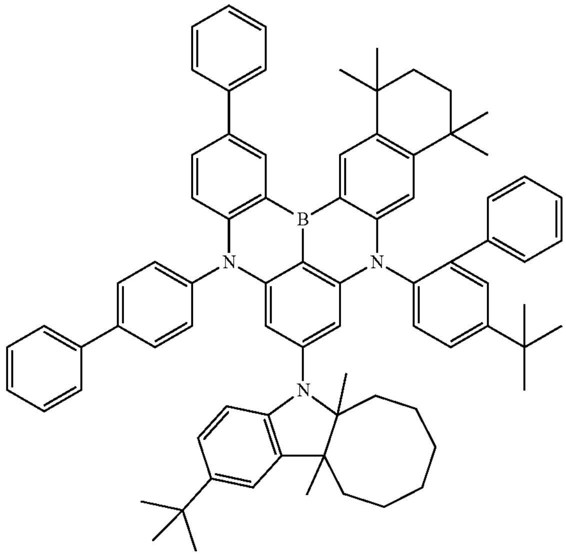

-continued
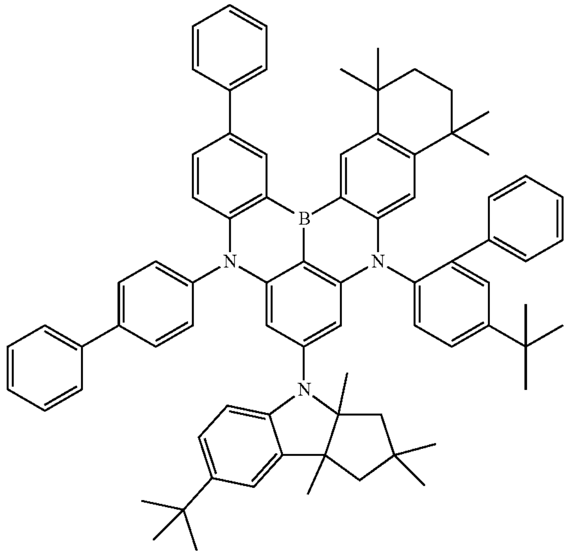
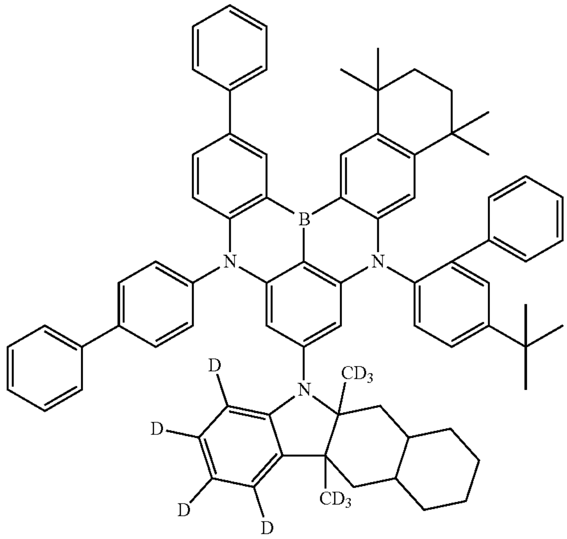
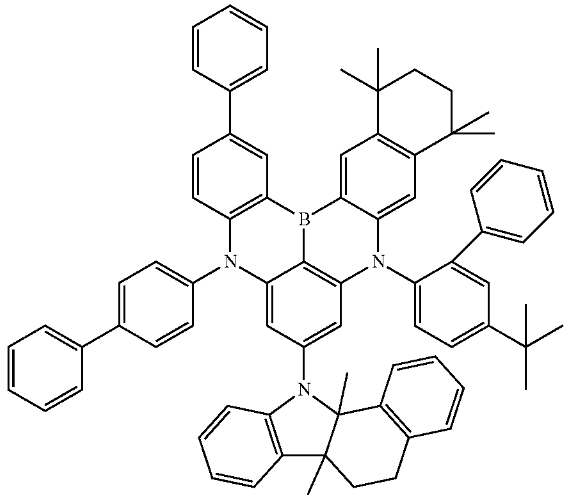
-continued
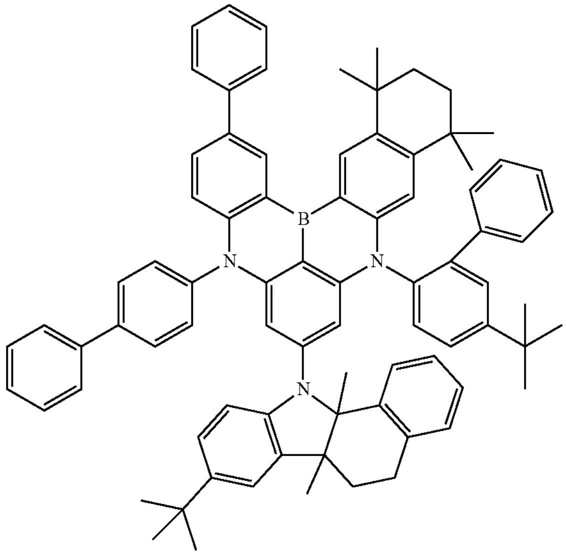
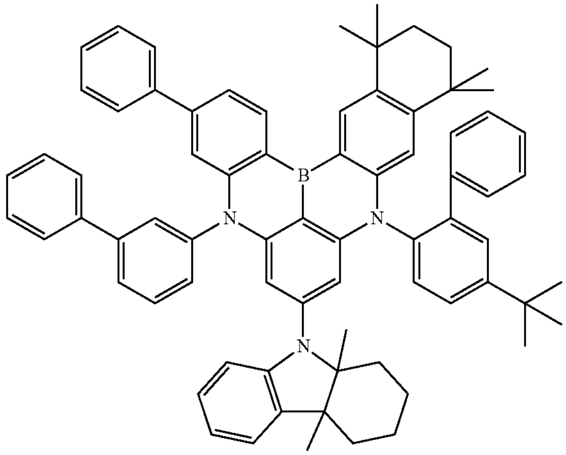
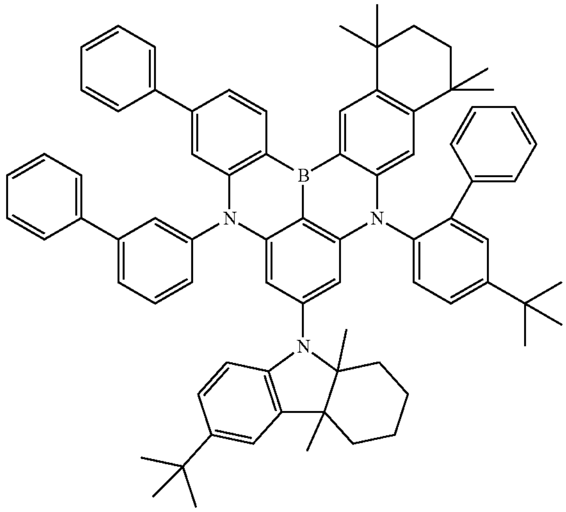

-continued
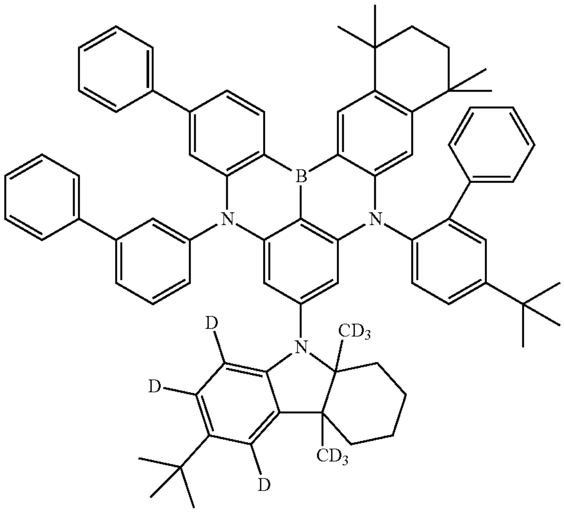
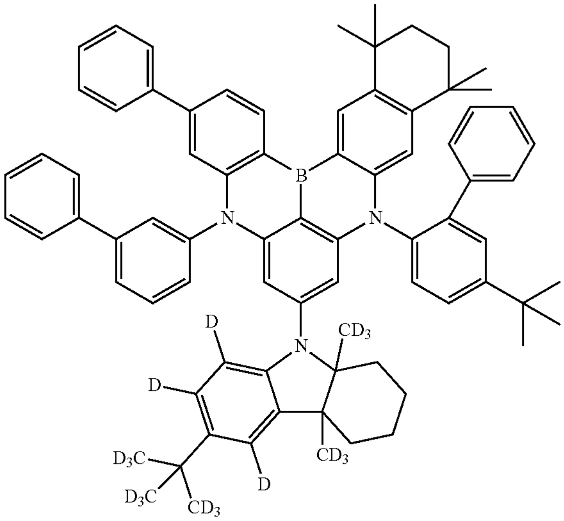
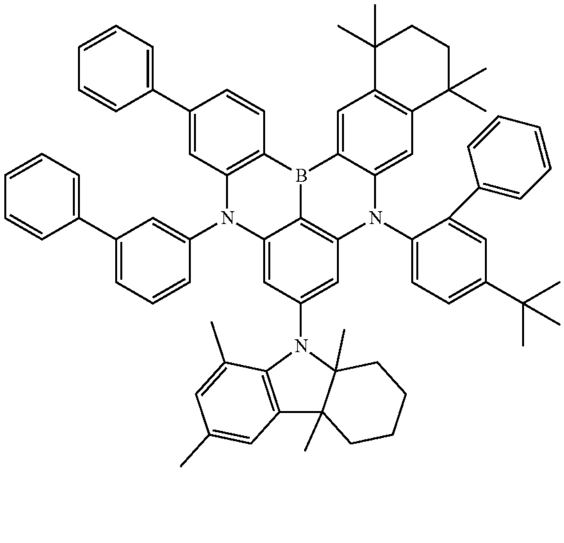
-continued
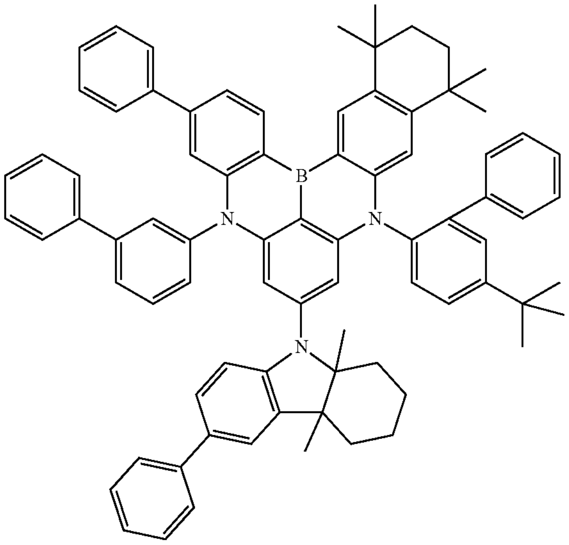
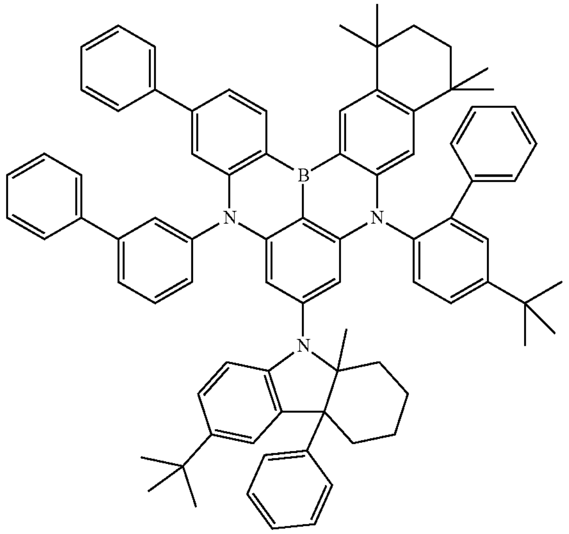
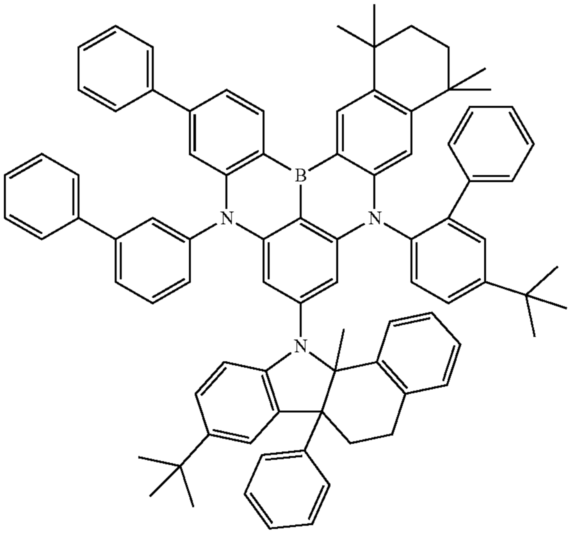

-continued
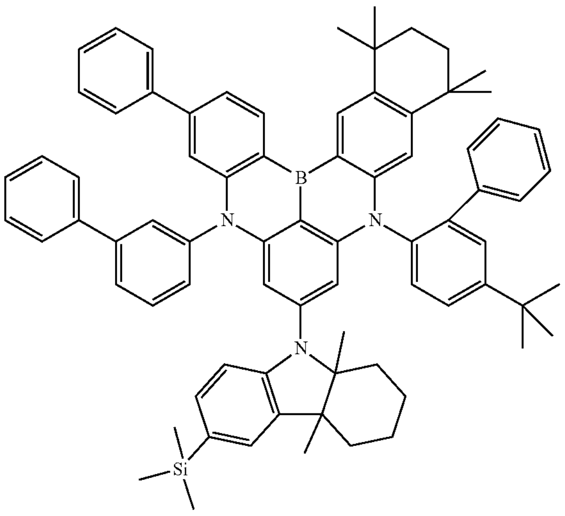
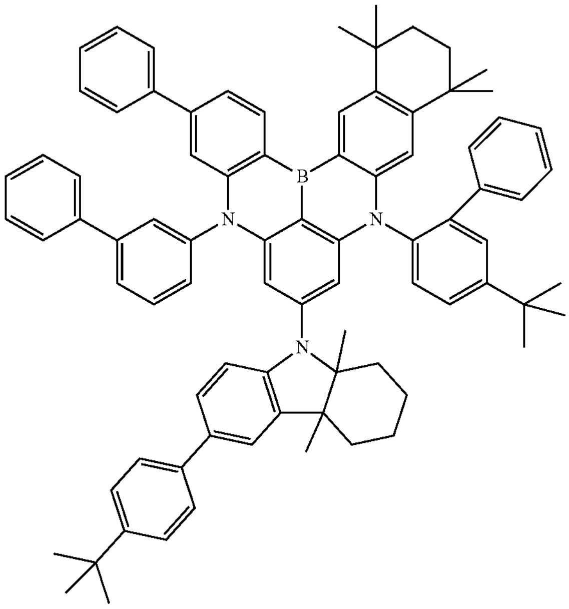
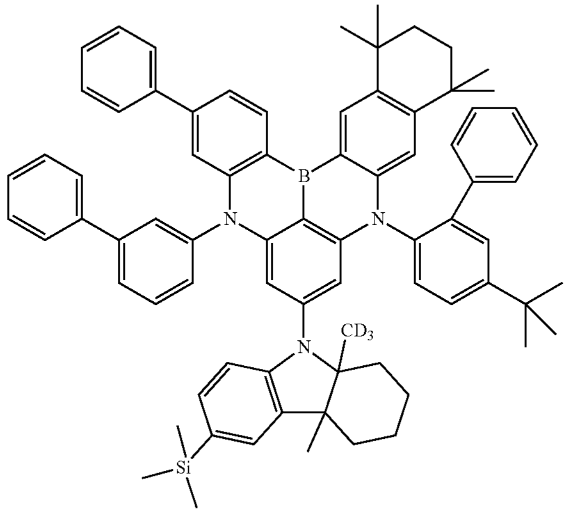
-continued
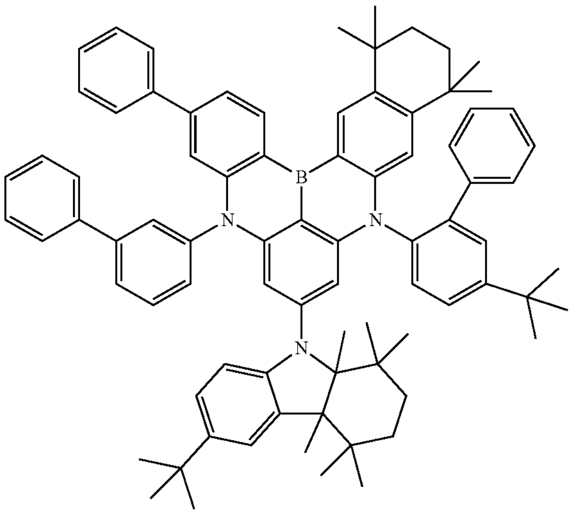
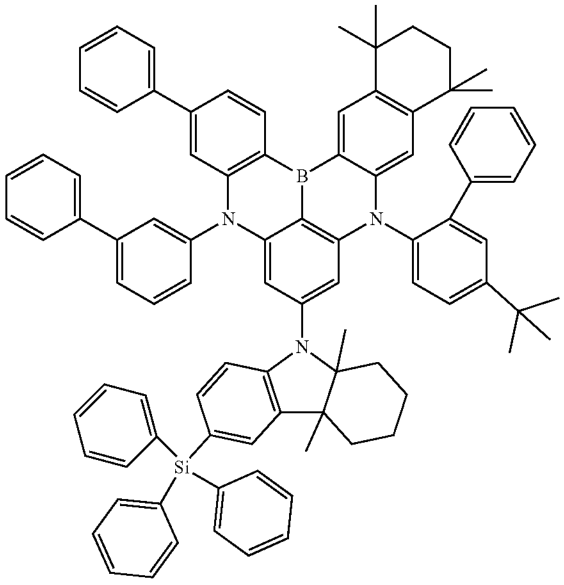
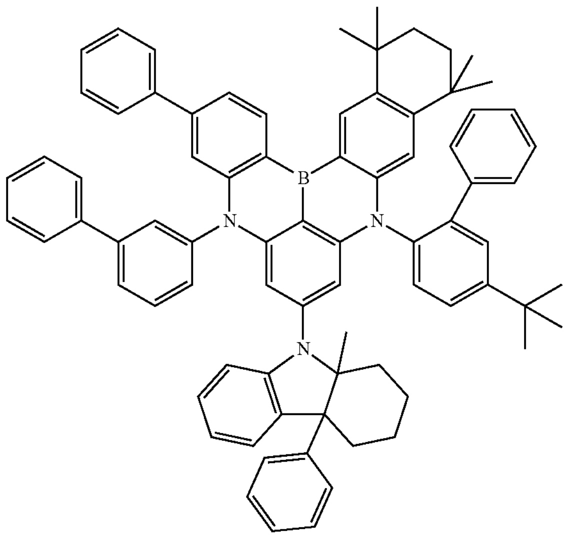

-continued
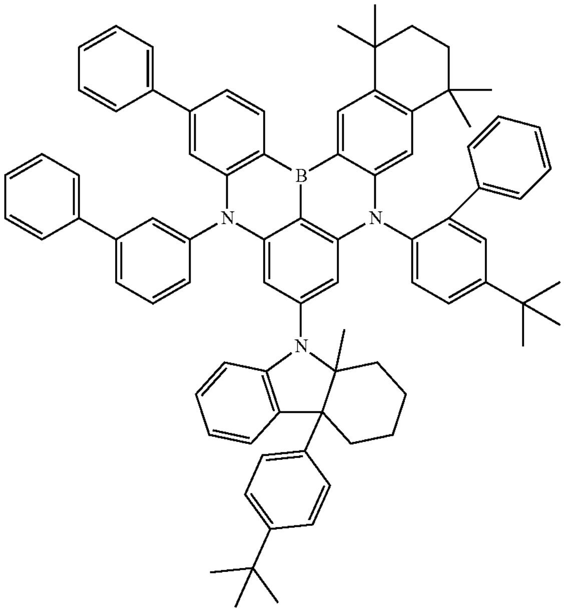
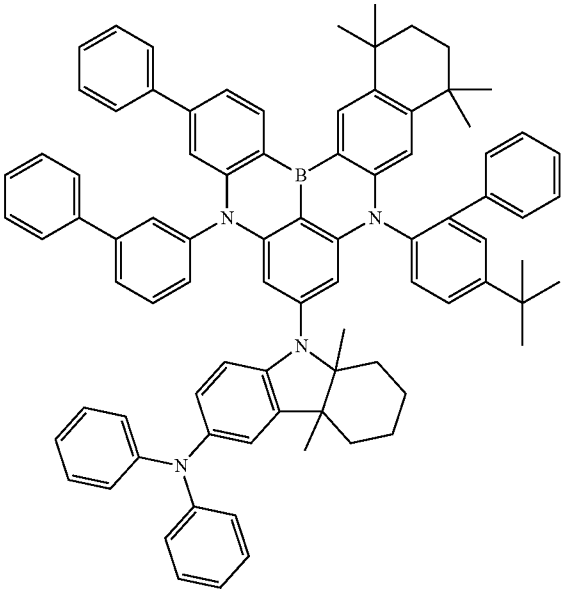
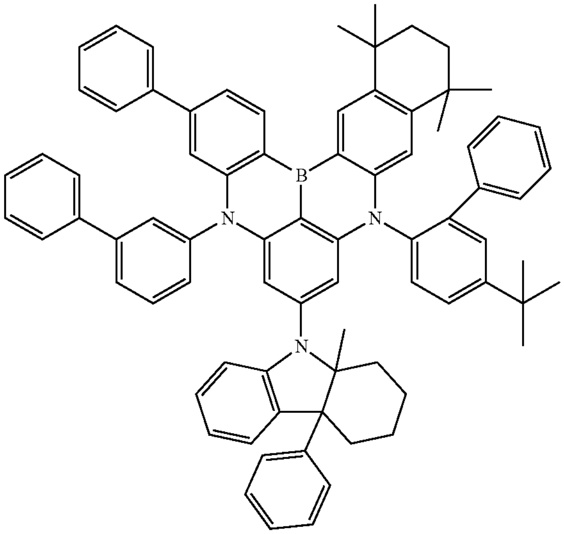
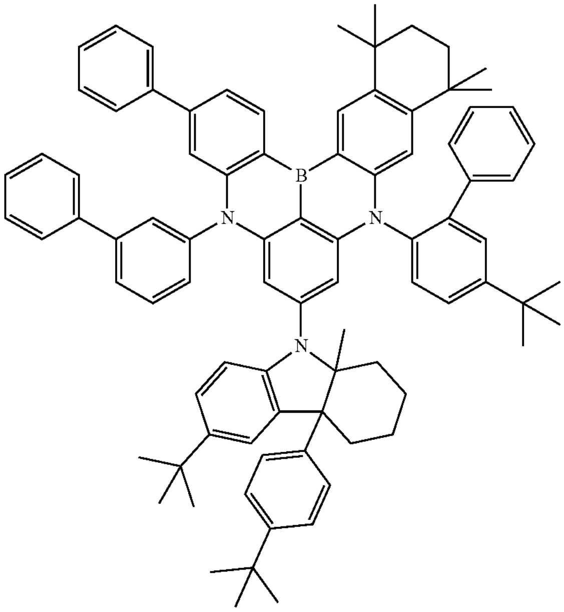
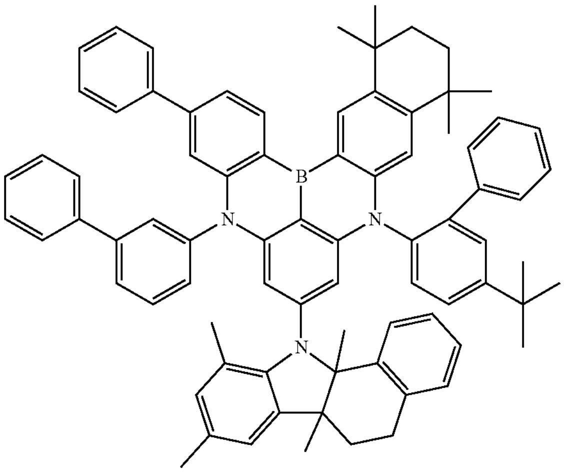

-continued
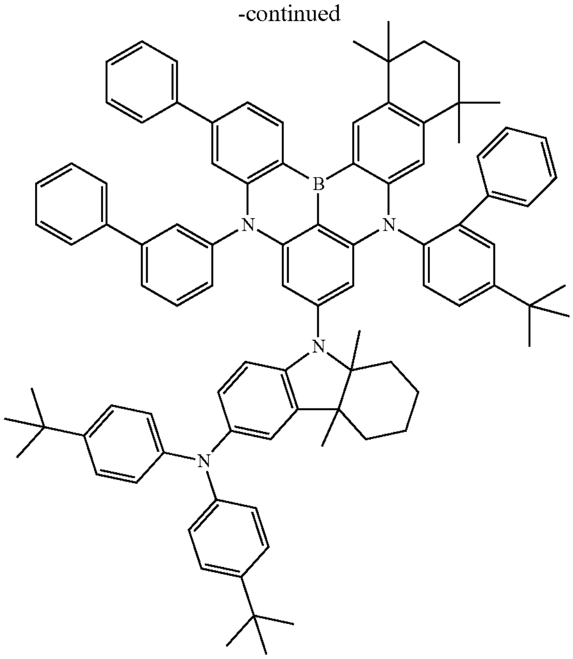
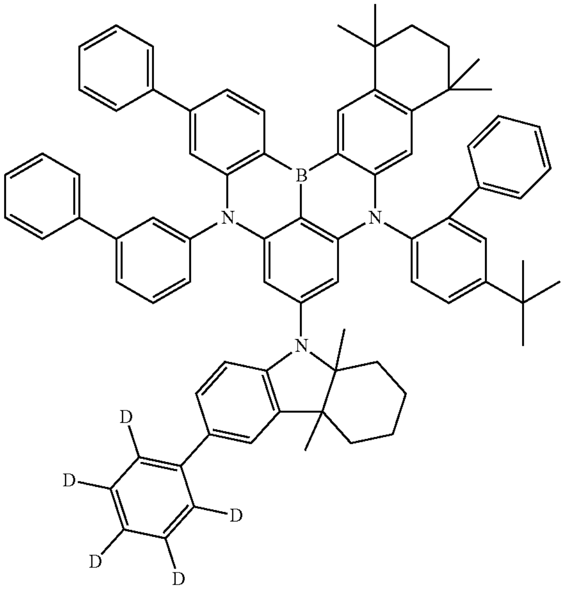
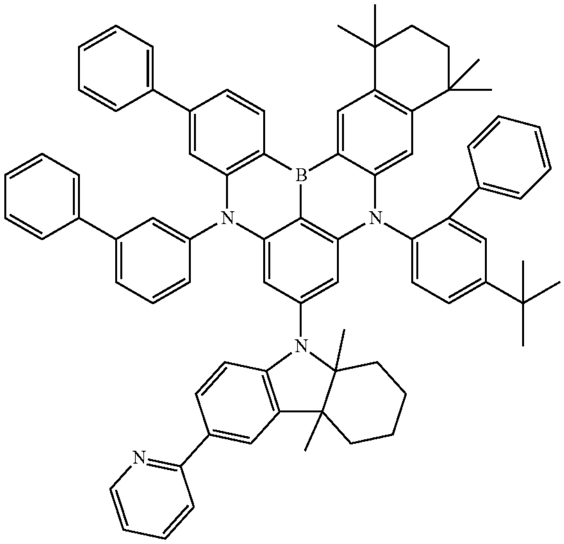
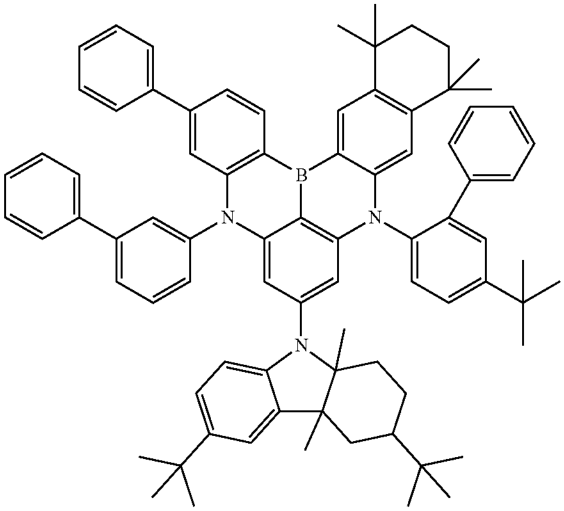
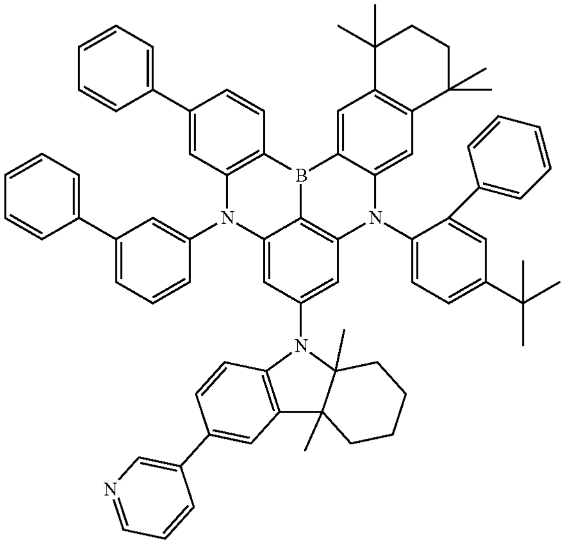
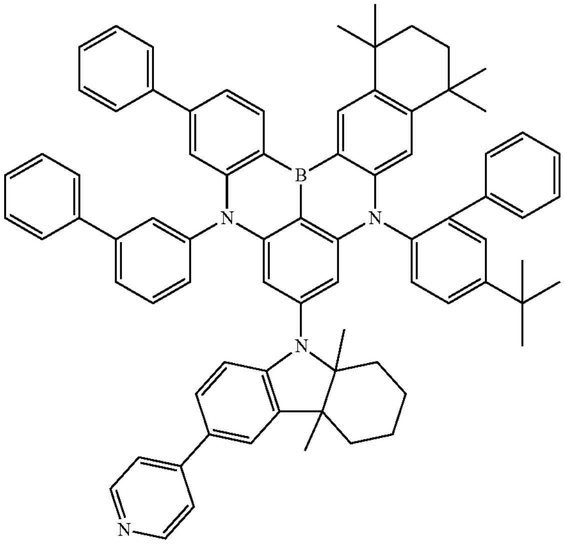

-continued
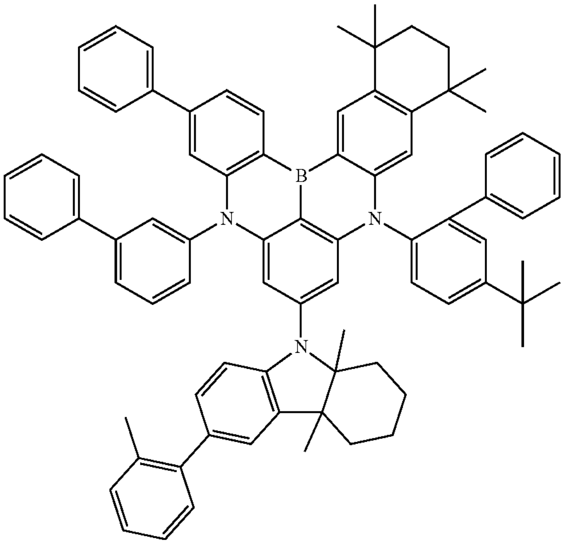
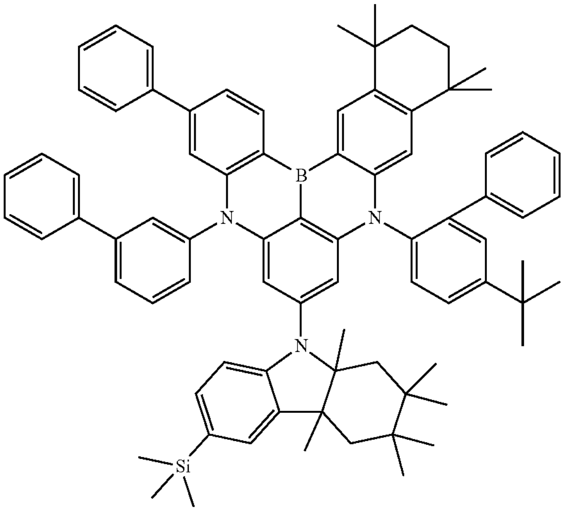
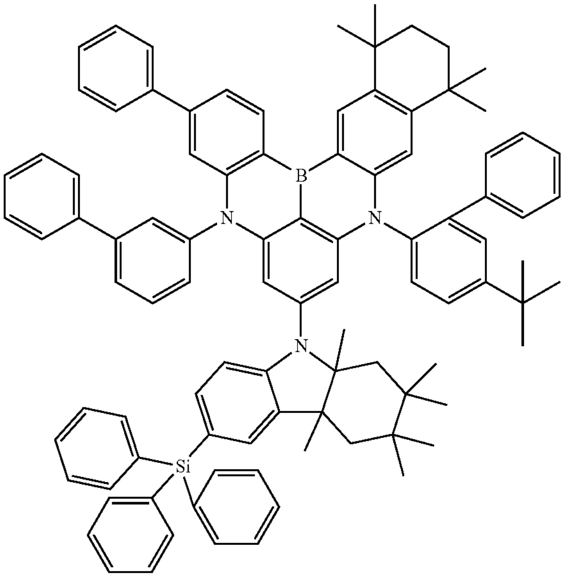
-continued
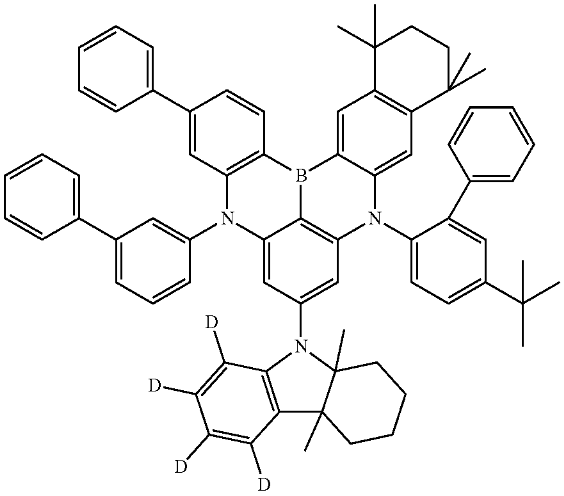
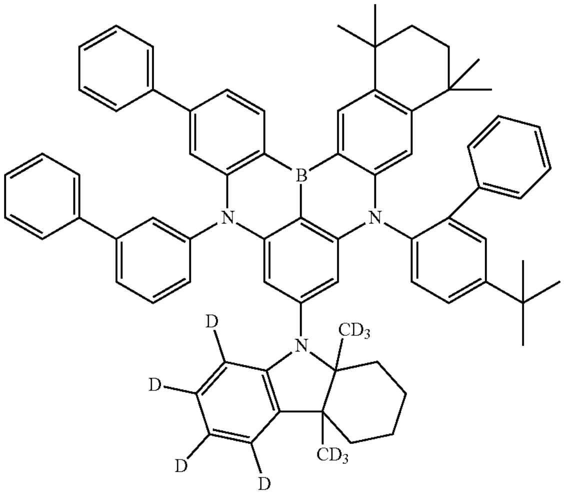
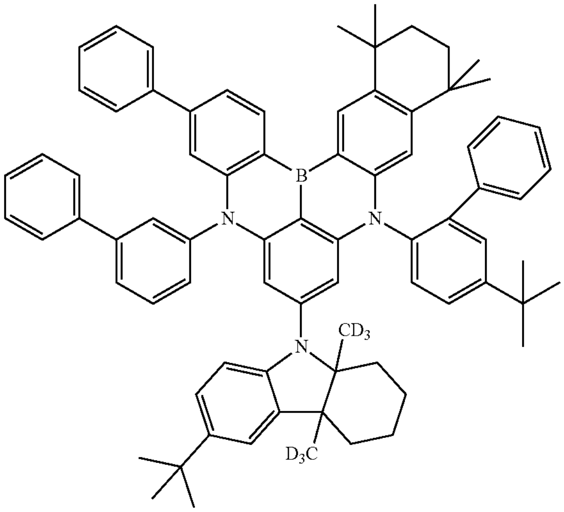

-continued
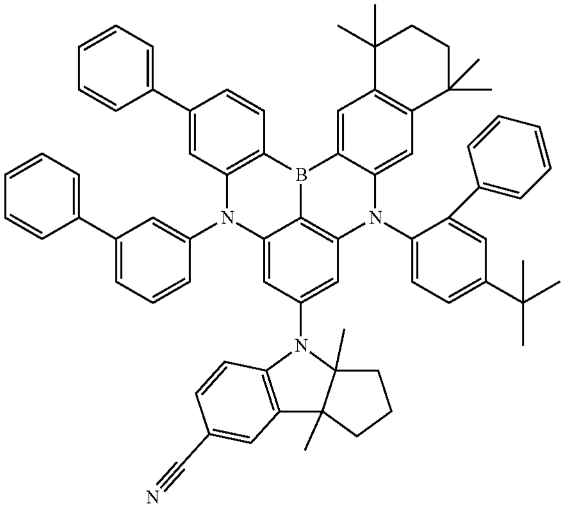
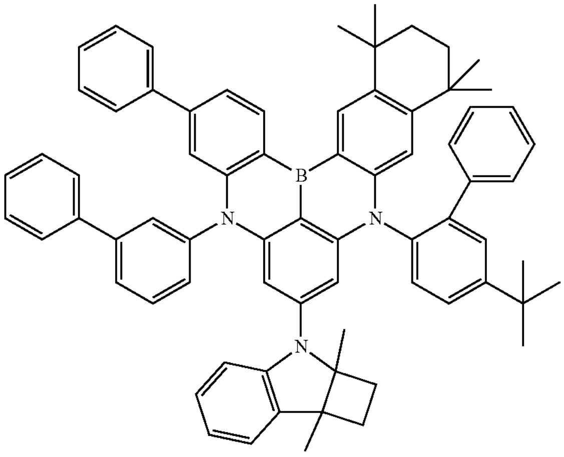
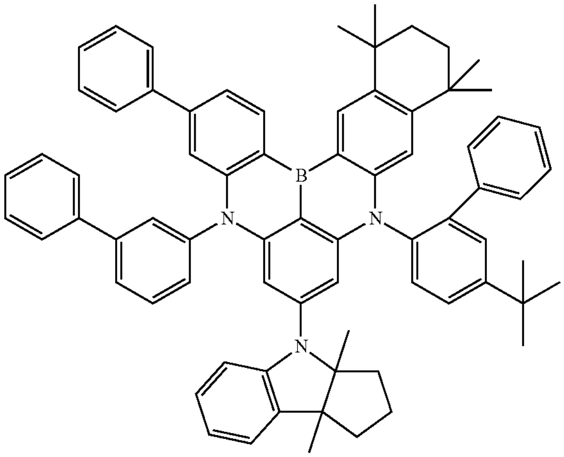
-continued
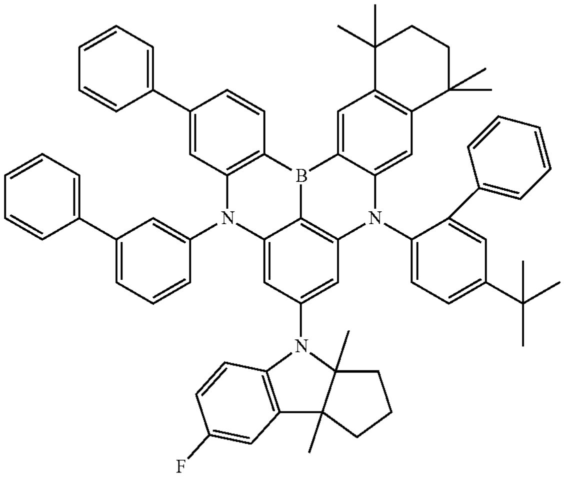
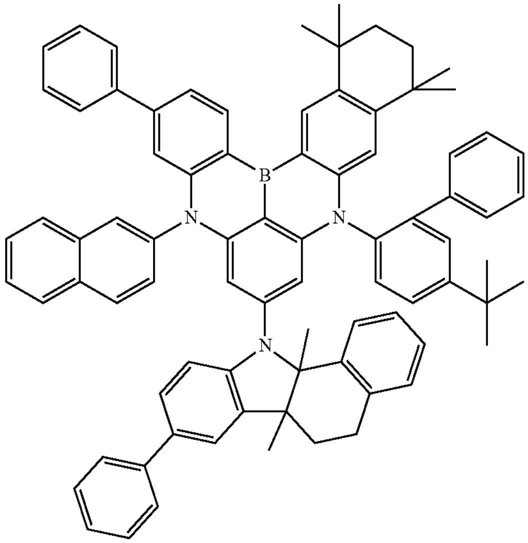
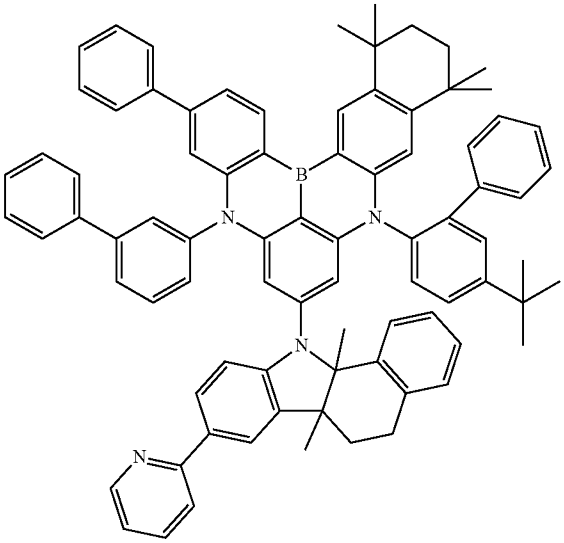

-continued
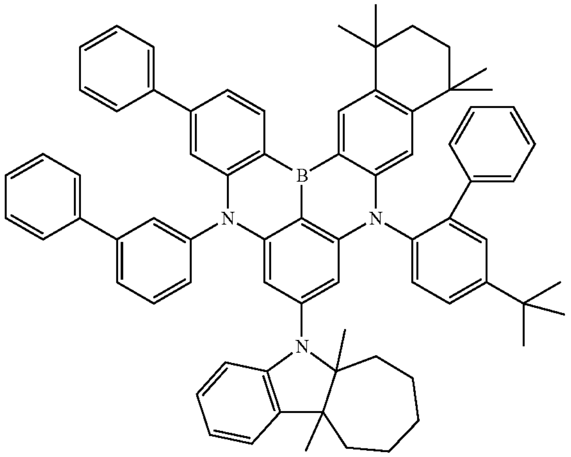
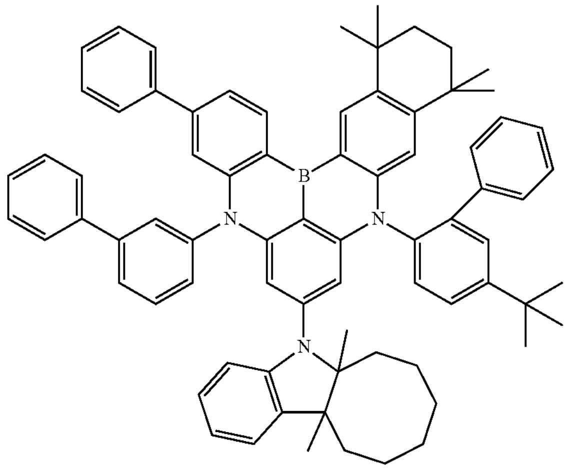
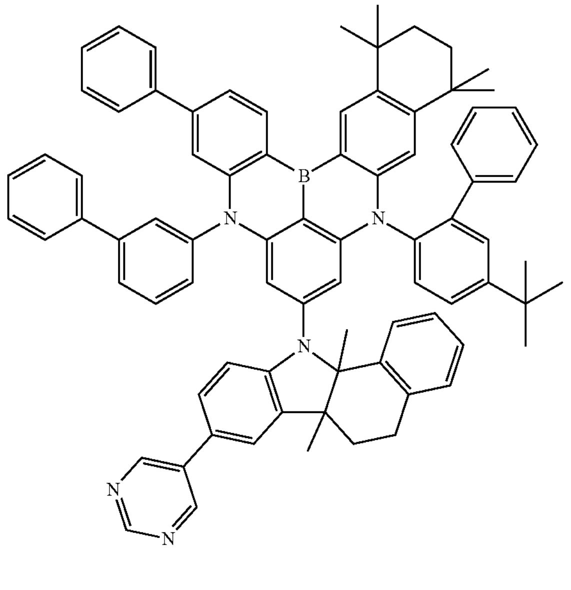
-continued
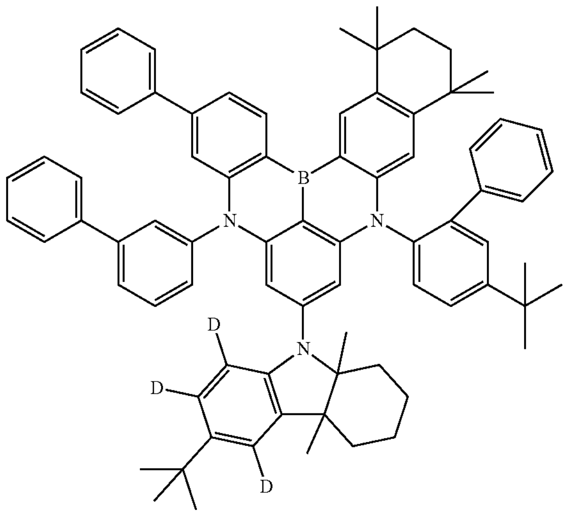
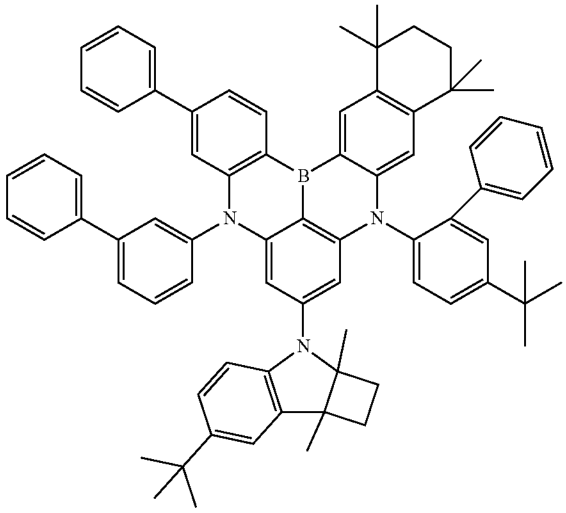
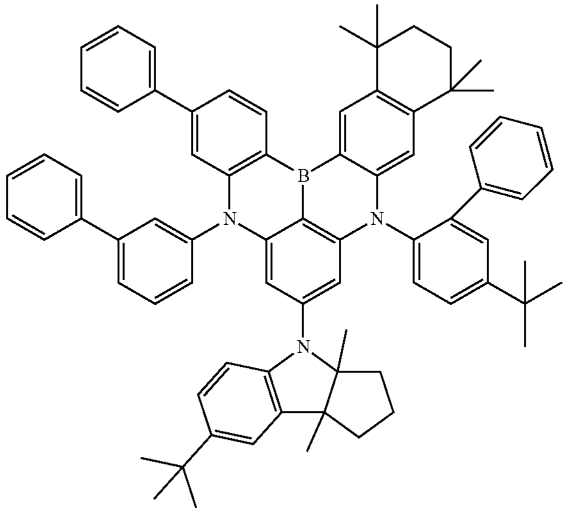

-continued
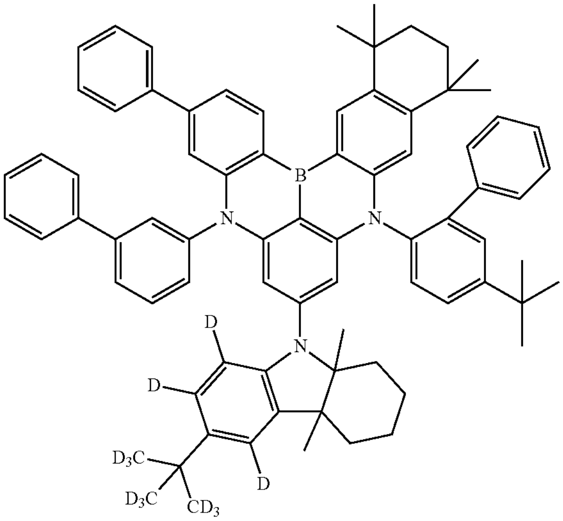
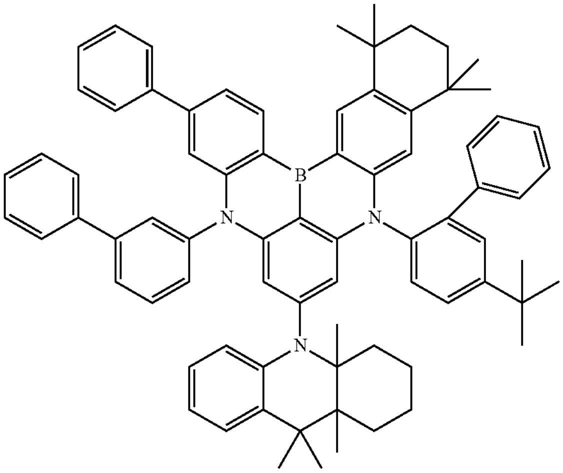
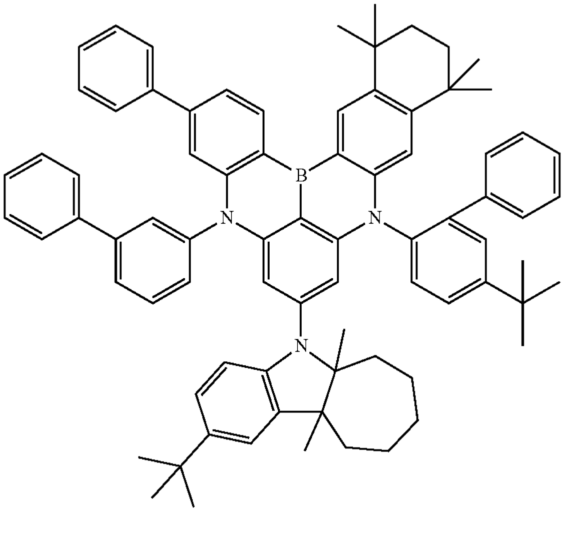
-continued
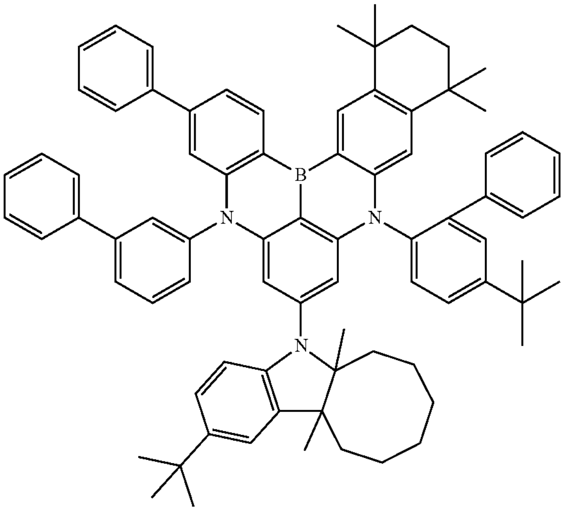
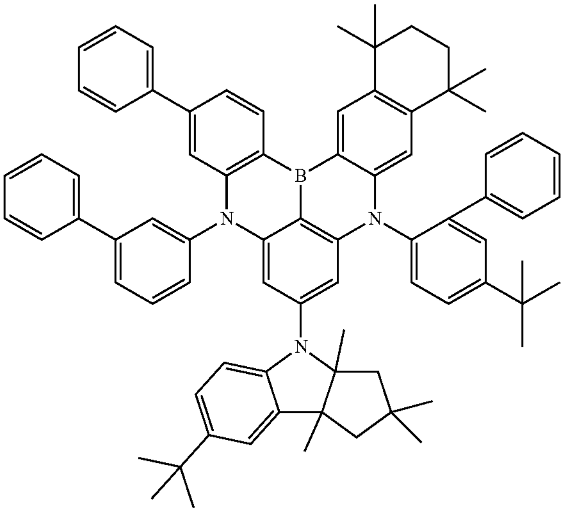
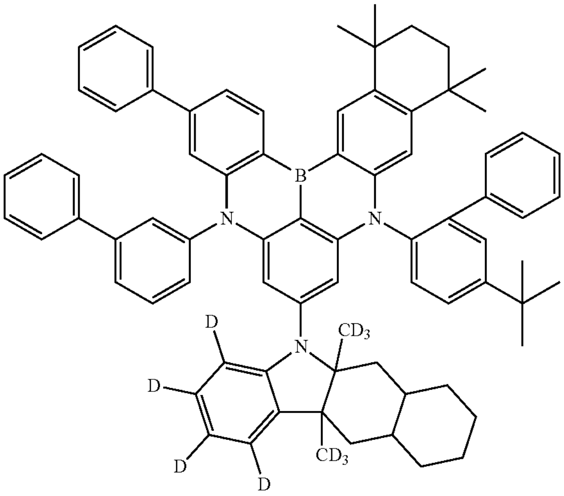

-continued
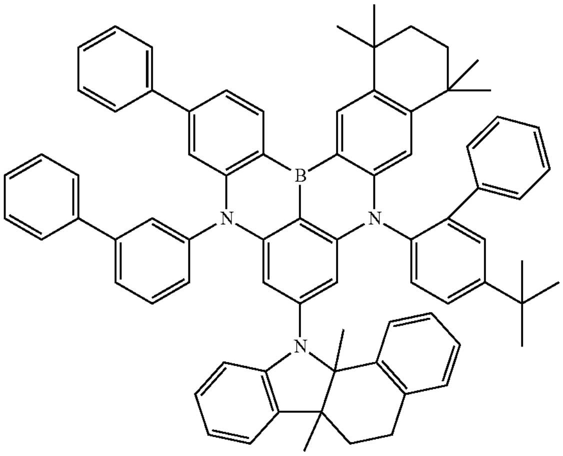
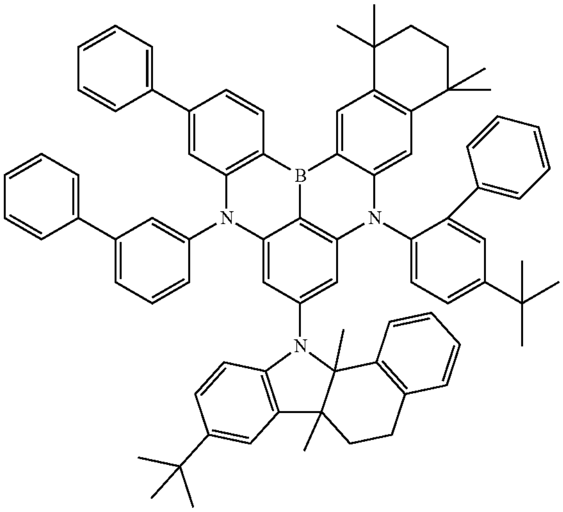
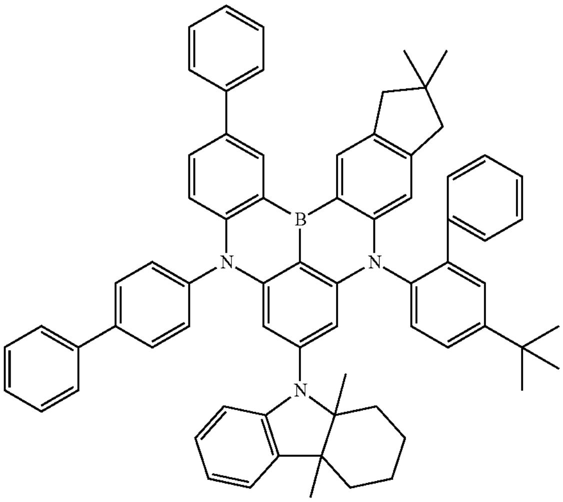
-continued
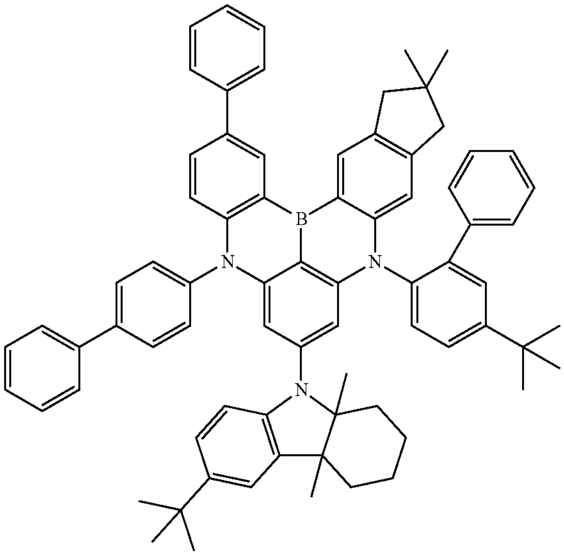
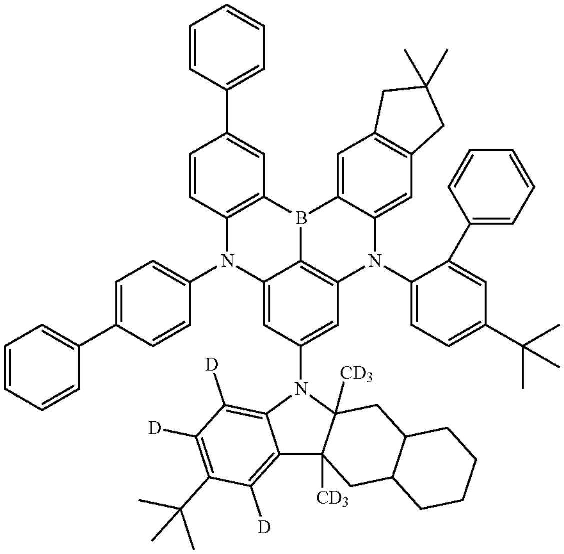
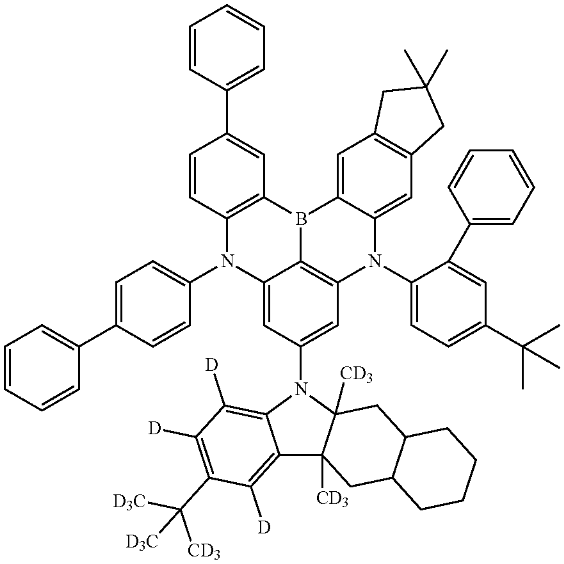

-continued
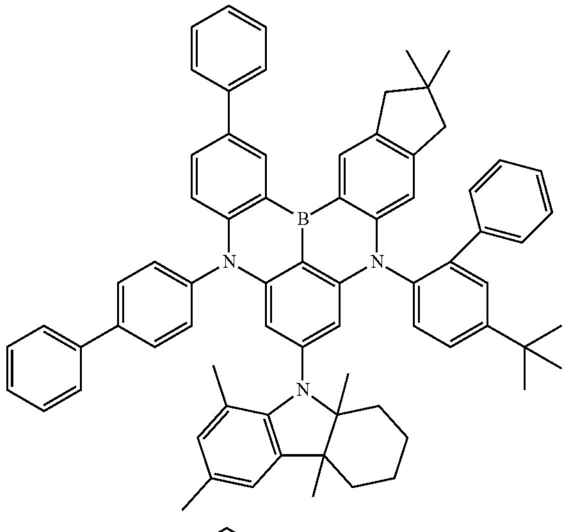
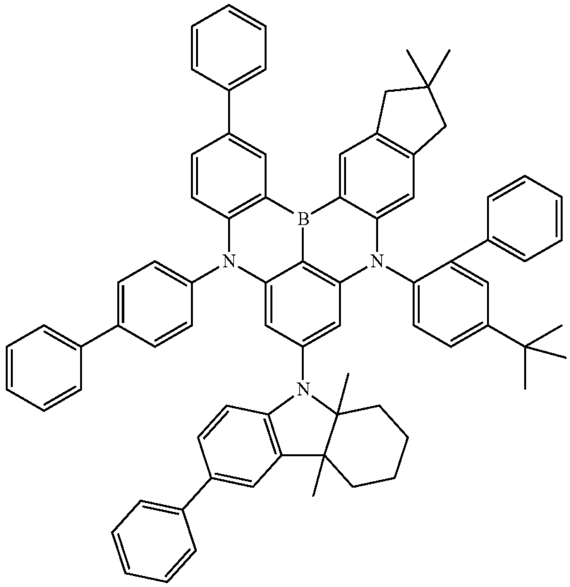
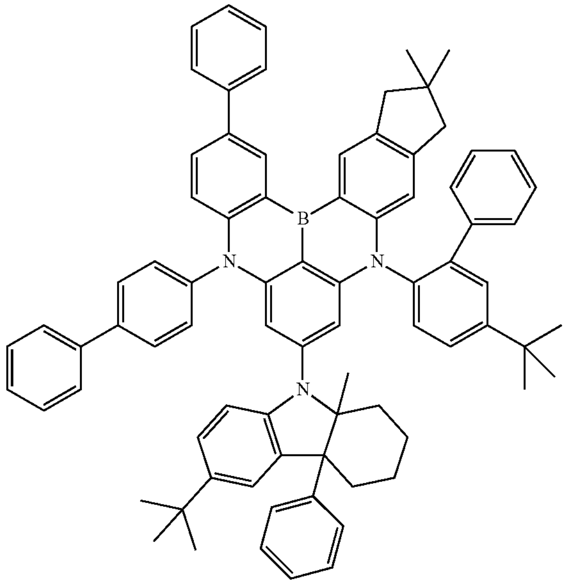
-continued
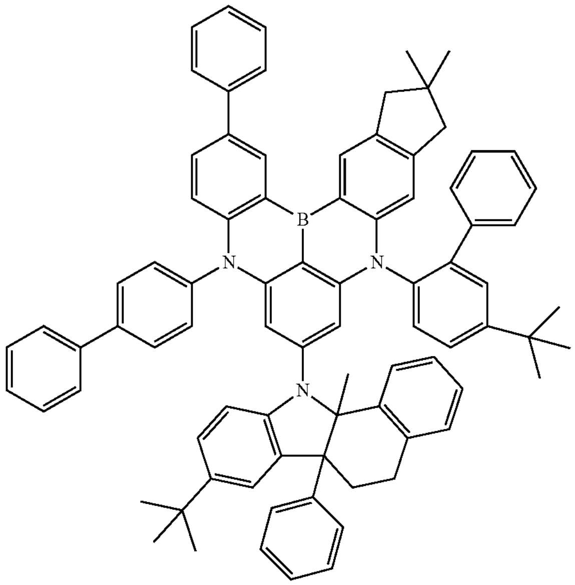
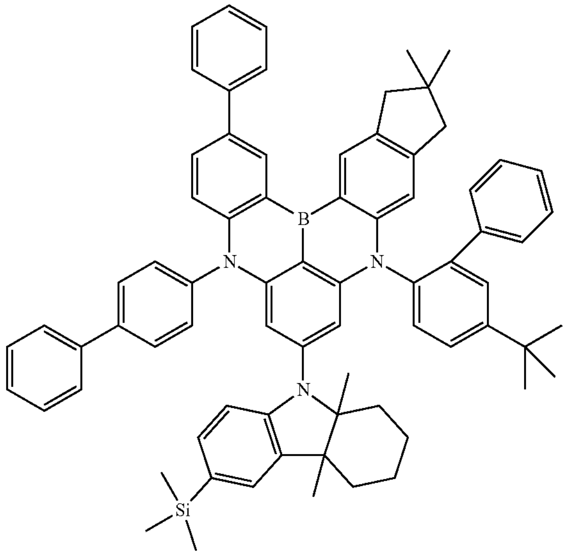

-continued
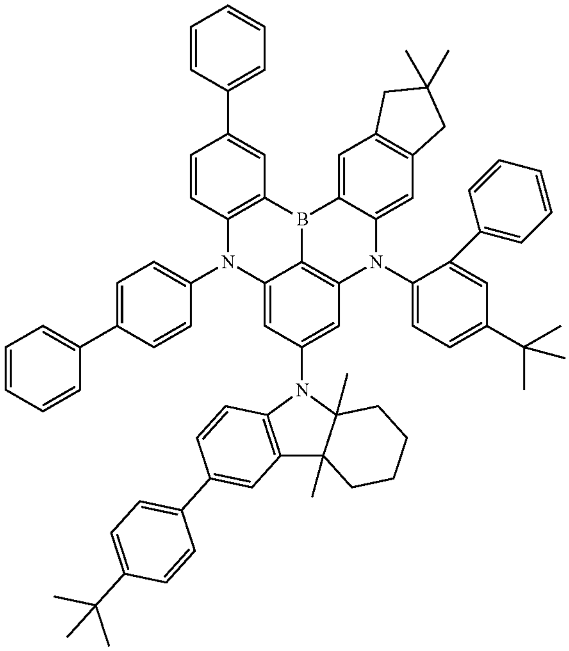
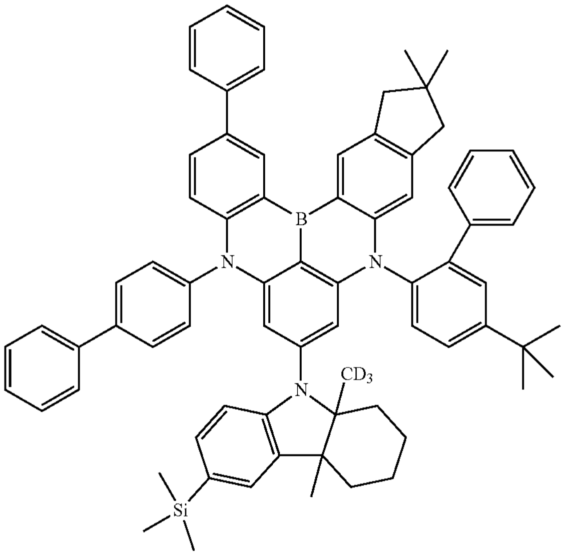
-continued
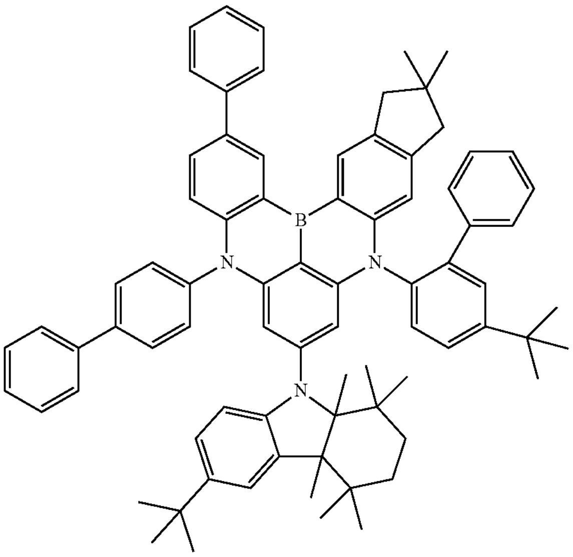
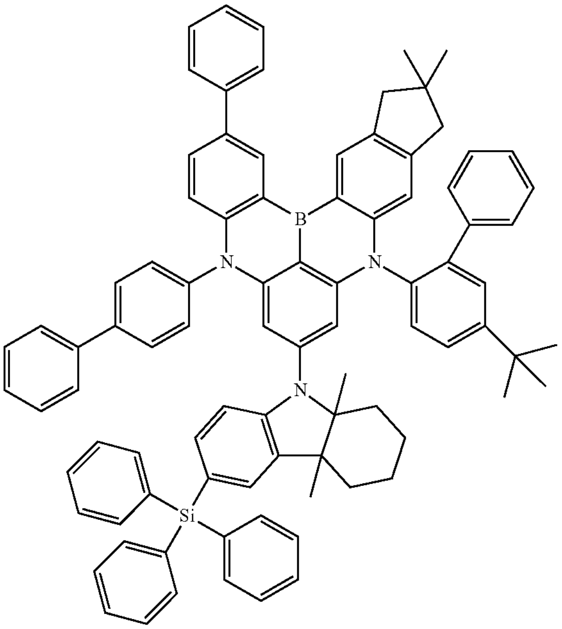

-continued
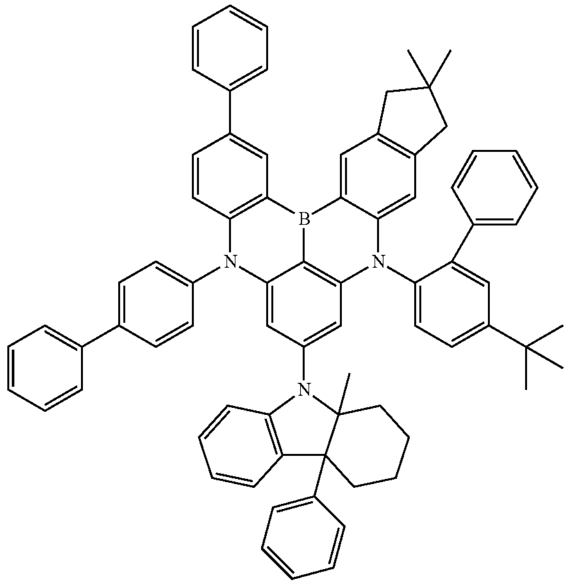
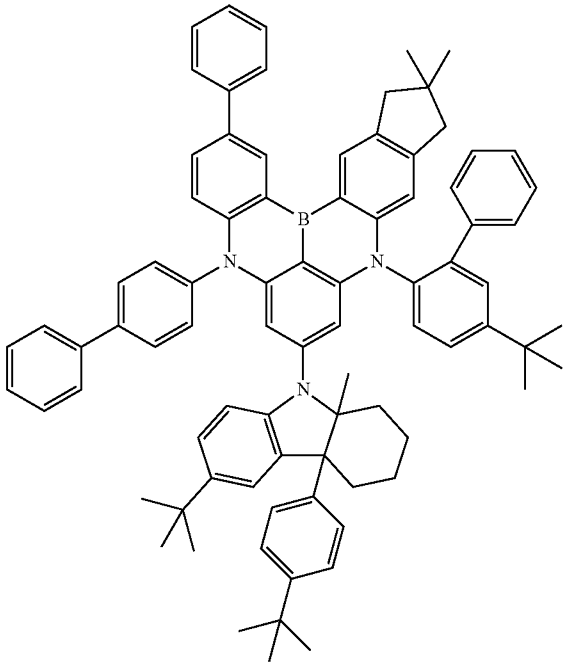
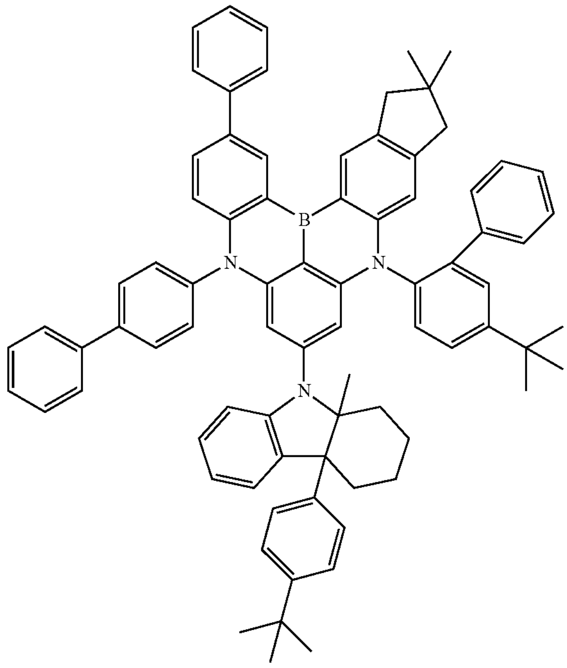
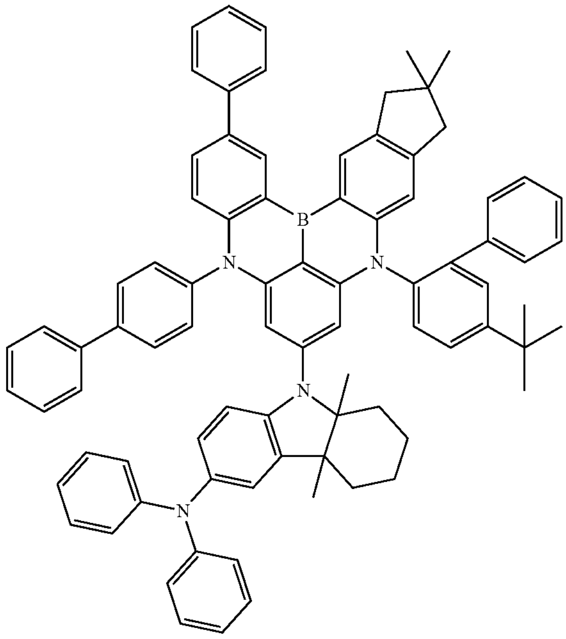

-continued
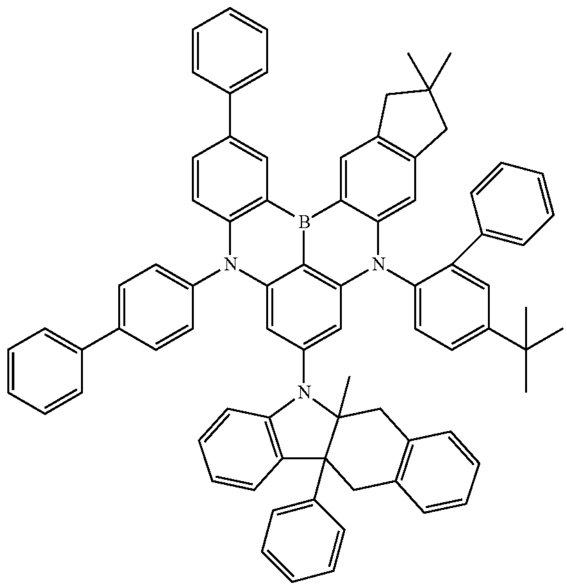
-continued
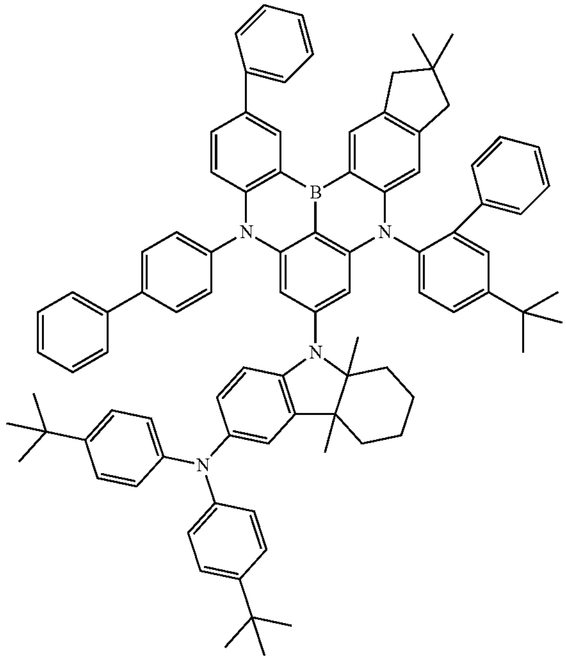
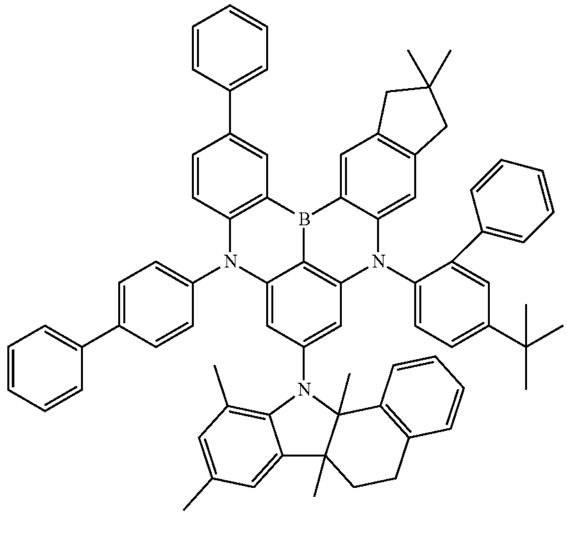
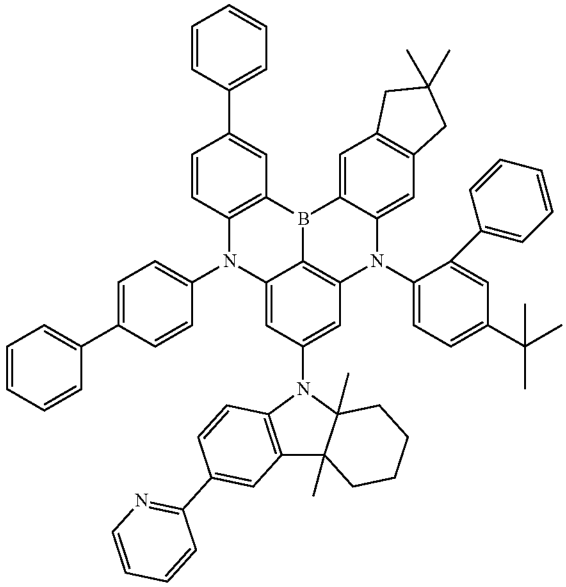

-continued
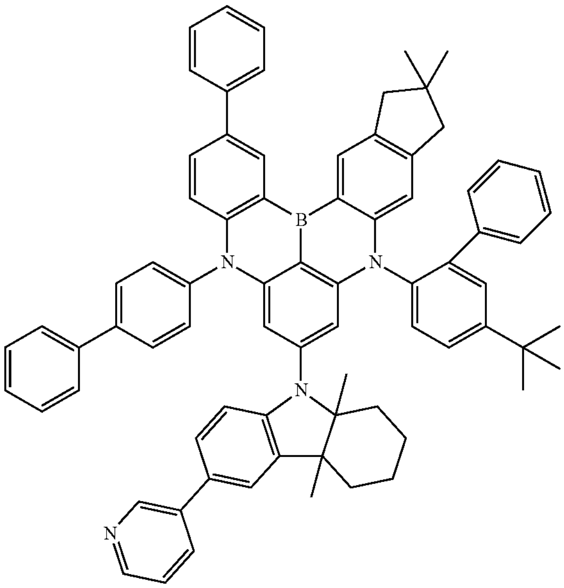
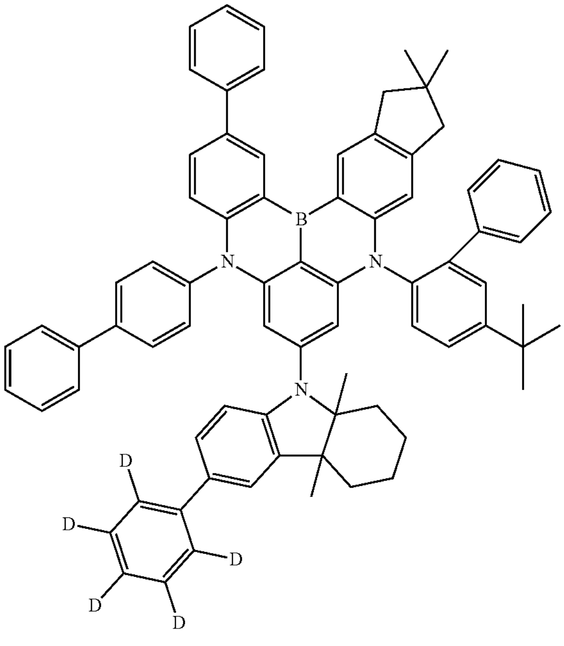
-continued
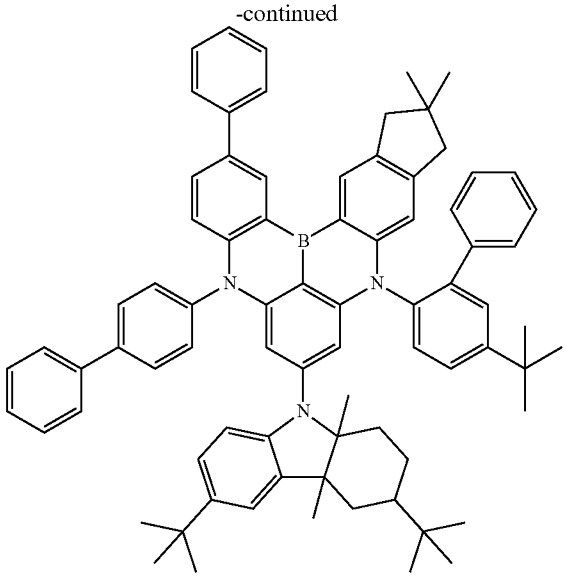
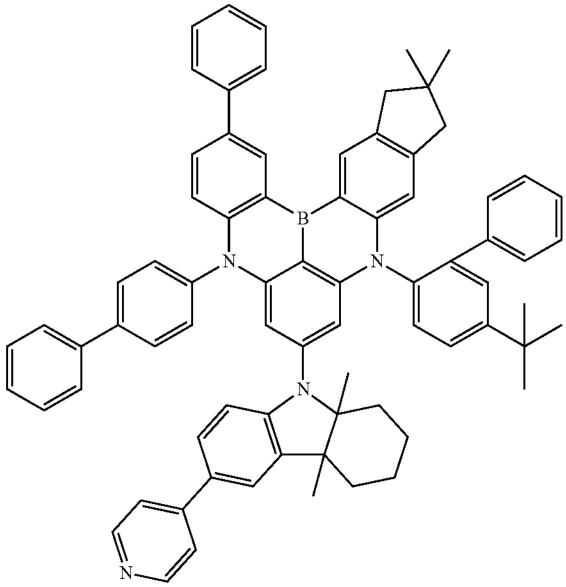
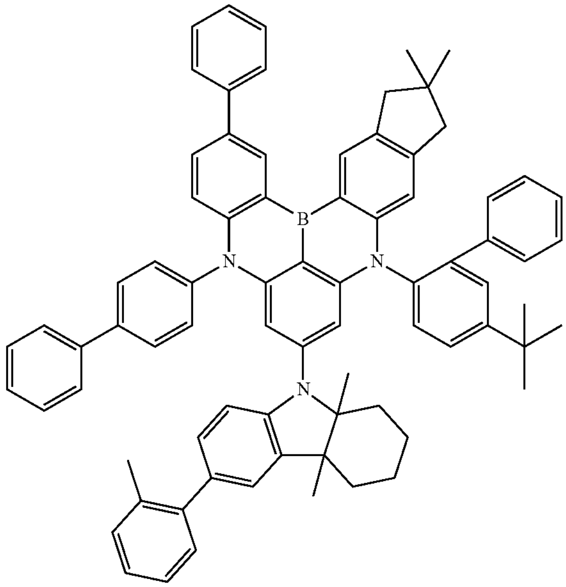

-continued
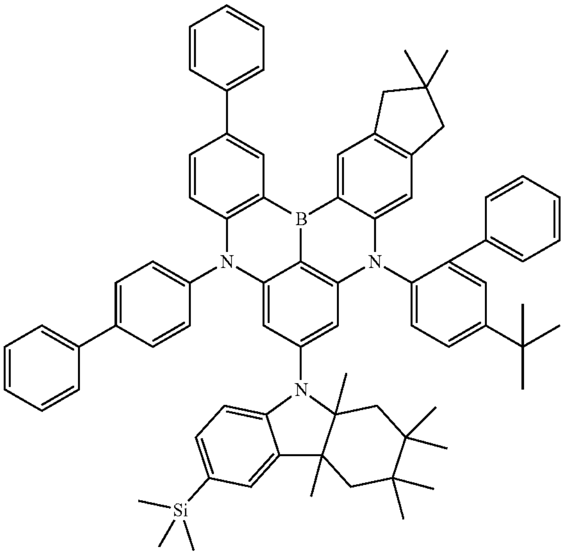
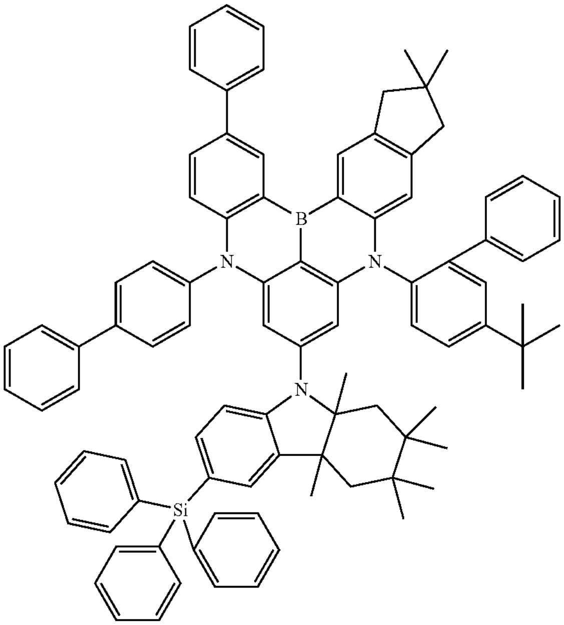
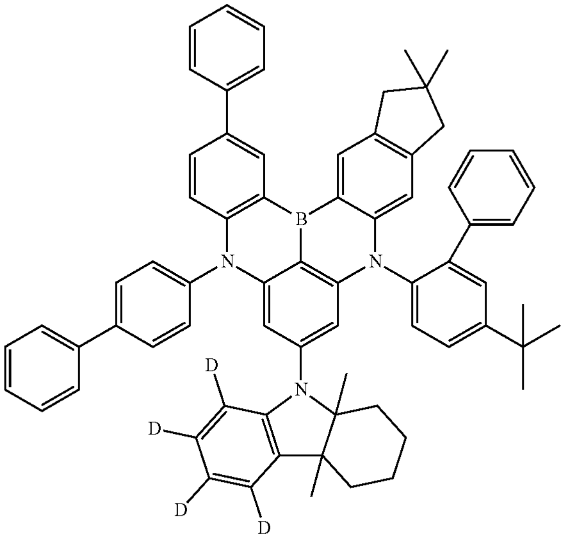
-continued
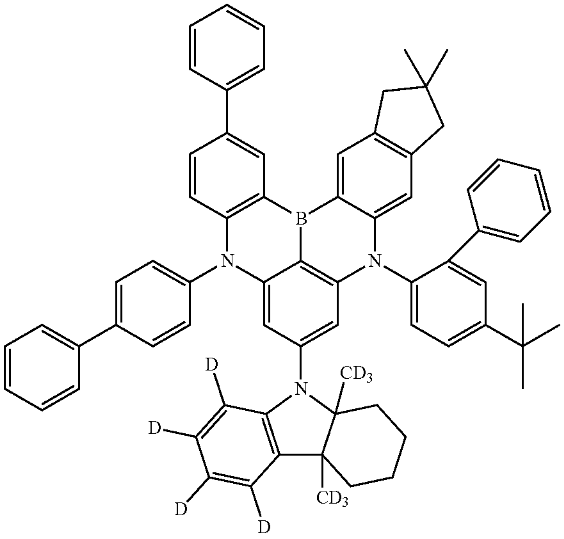
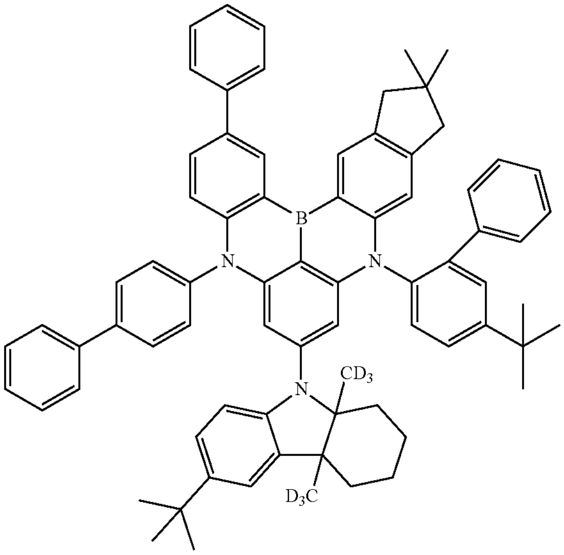
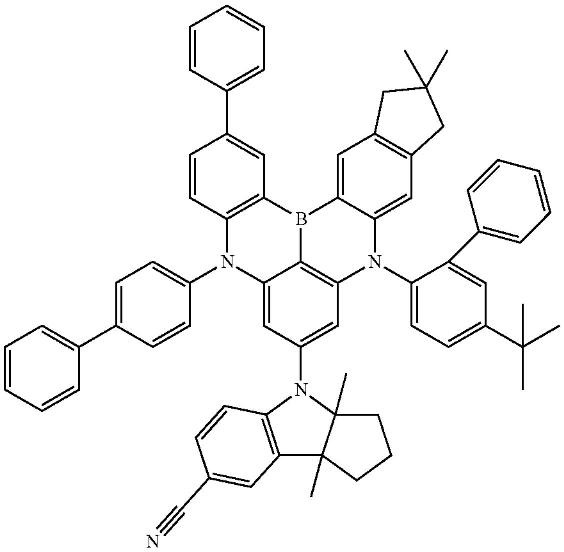

-continued
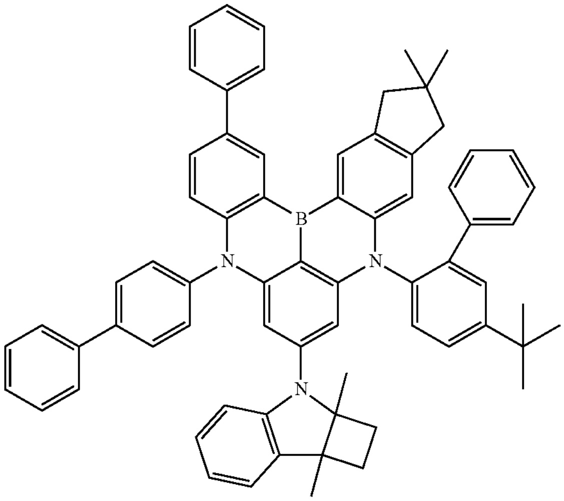
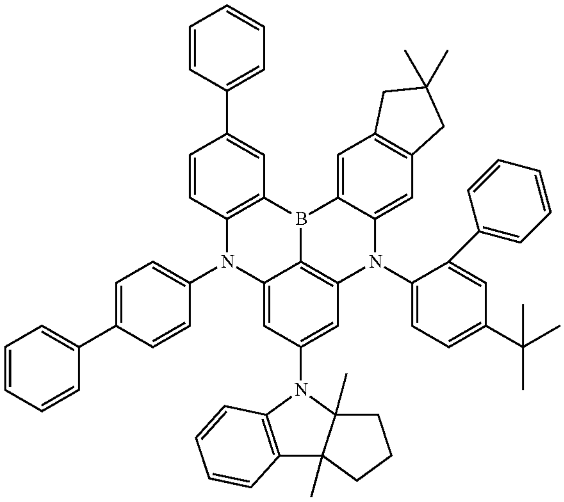
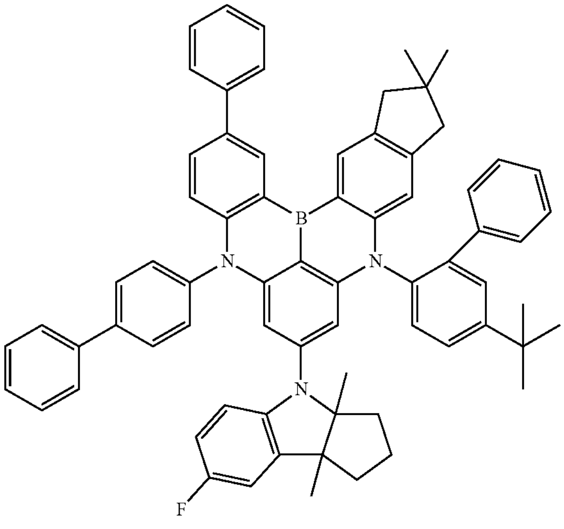
-continued
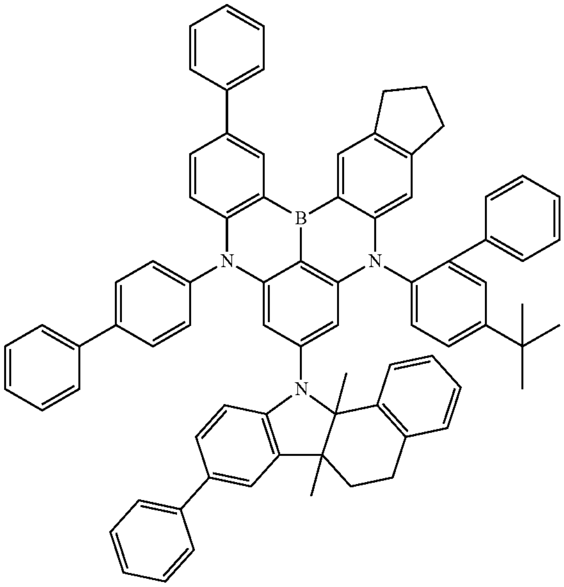
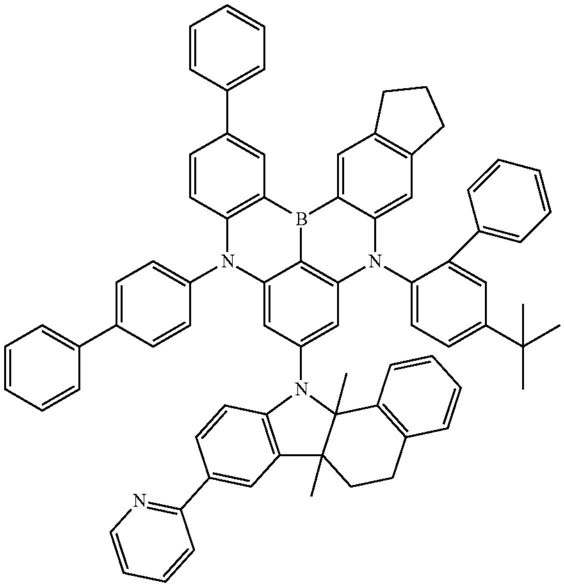
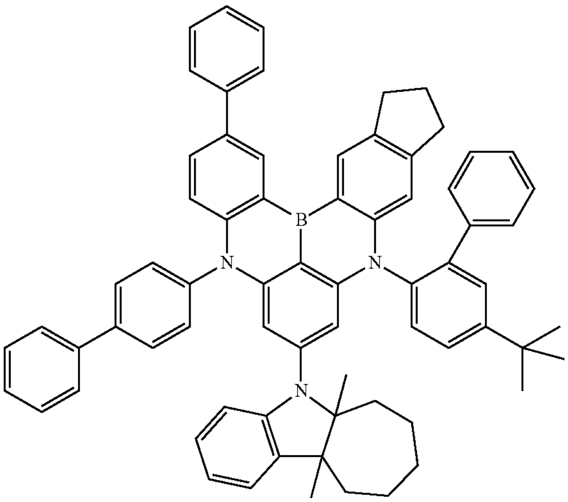

-continued
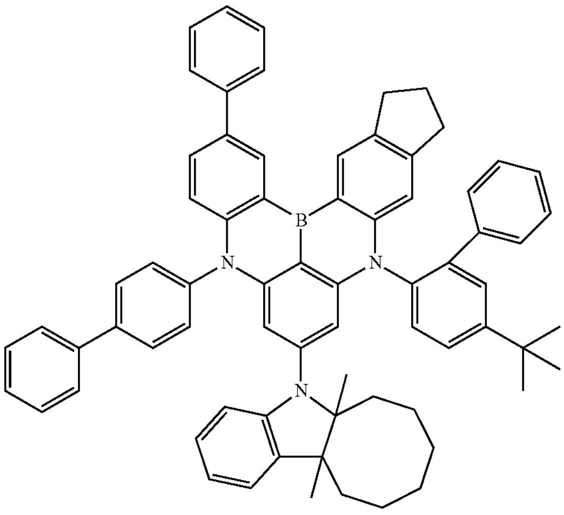
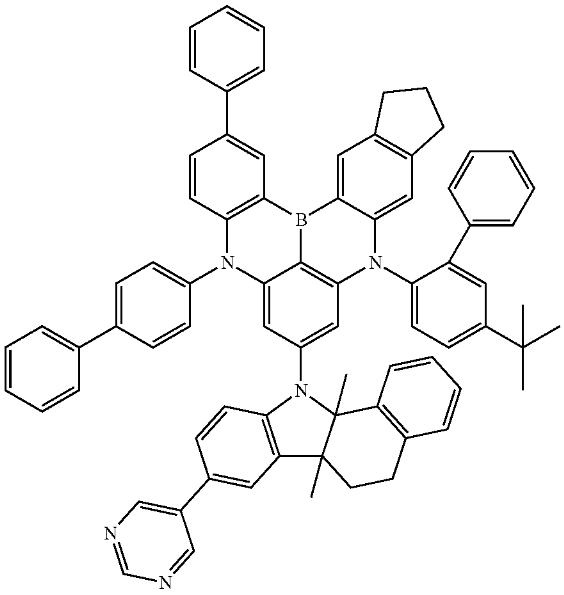
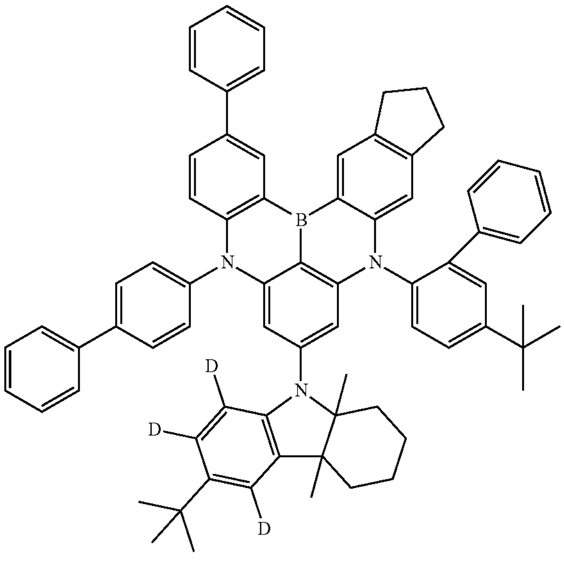
-continued
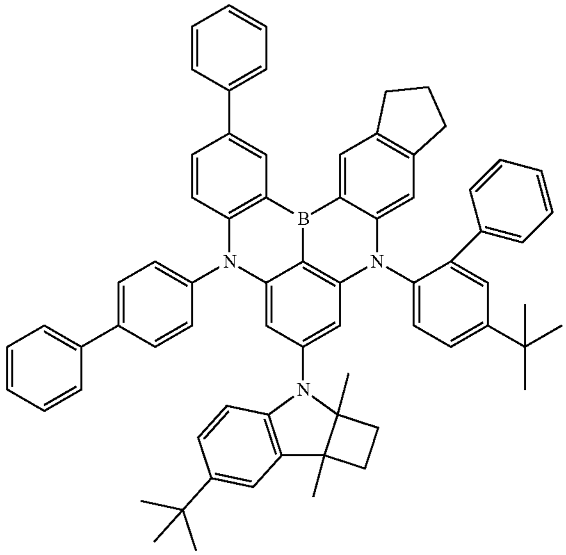
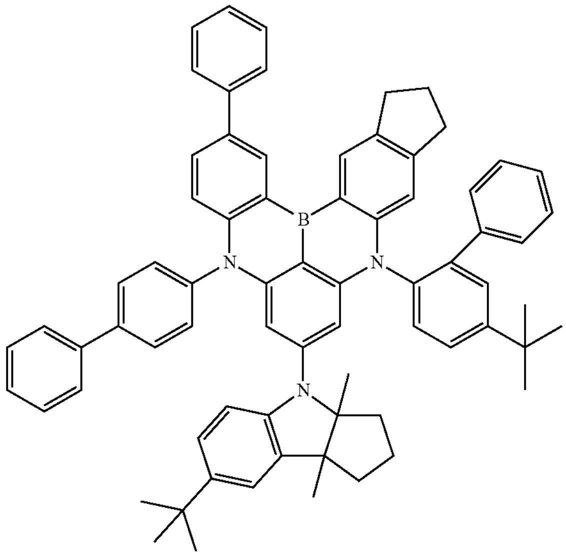
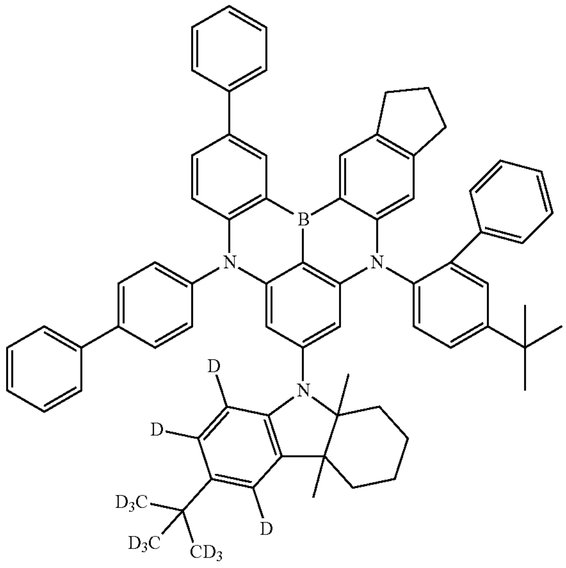

-continued
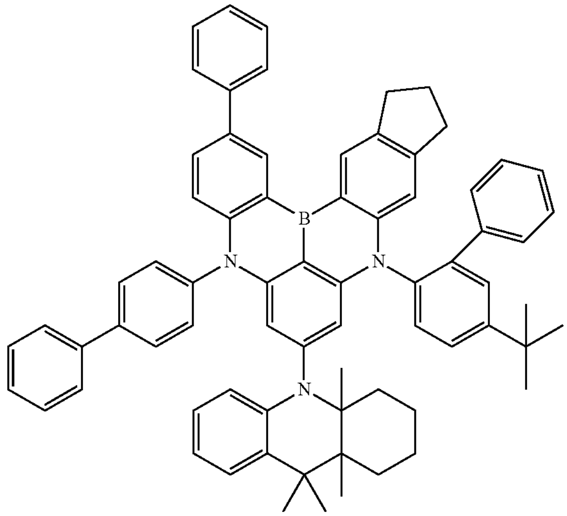
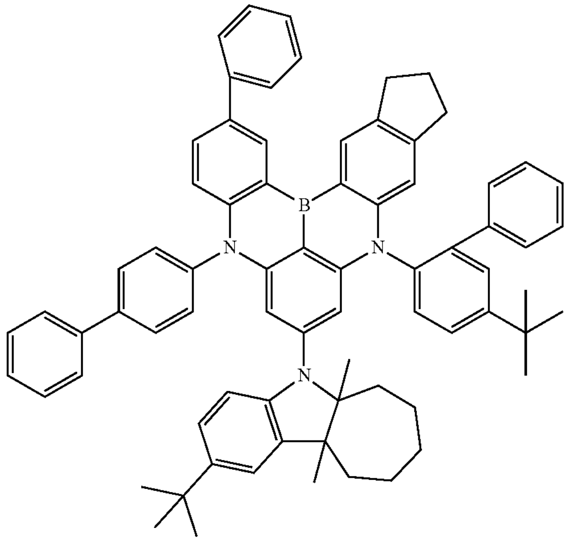
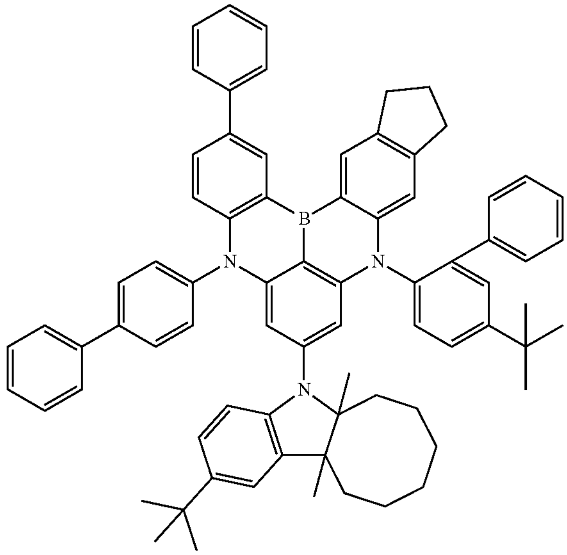
-continued
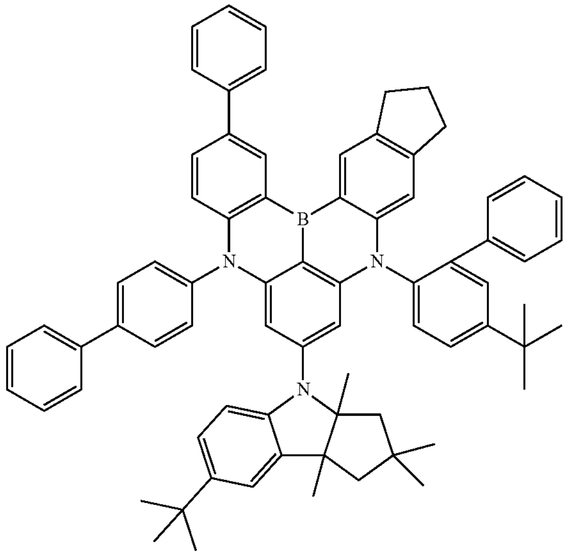
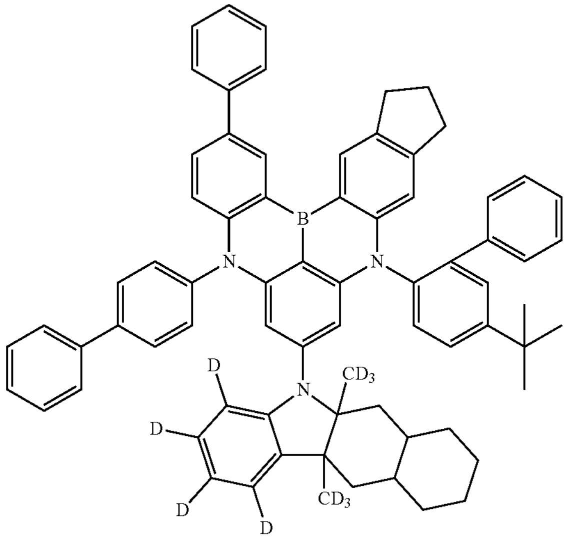
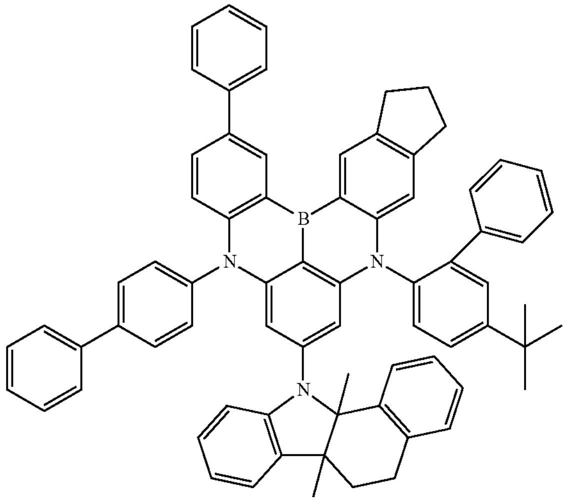

-continued
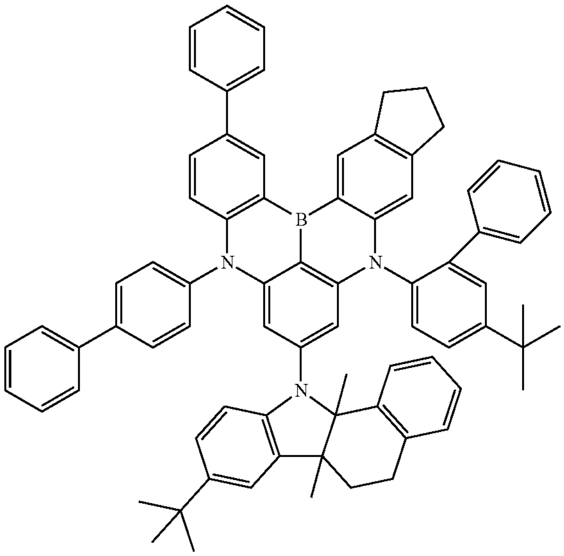 [SMILES: CC(C)(C)c1ccc(N2c3cc4c(cc3B3c5cc(-c6ccccc6)ccc5N(c5ccc(-c6ccccc6)cc5)c5cc(N6c7ccc(C(C)(C)C)cc7C7(C)CCc8ccccc8C67C)cc2c53)CCC4)c(-c2ccccc2)c1]
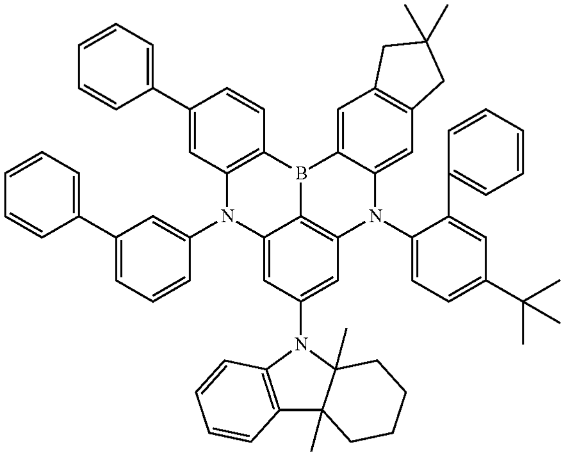
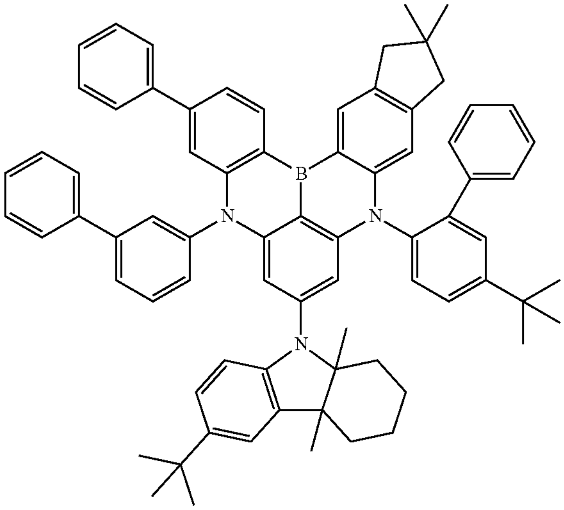
-continued
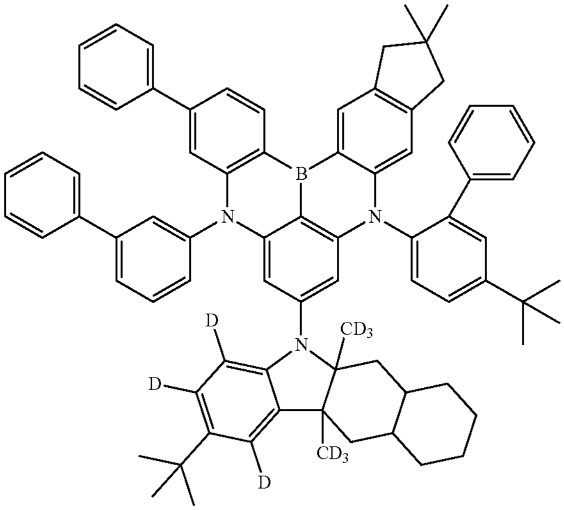
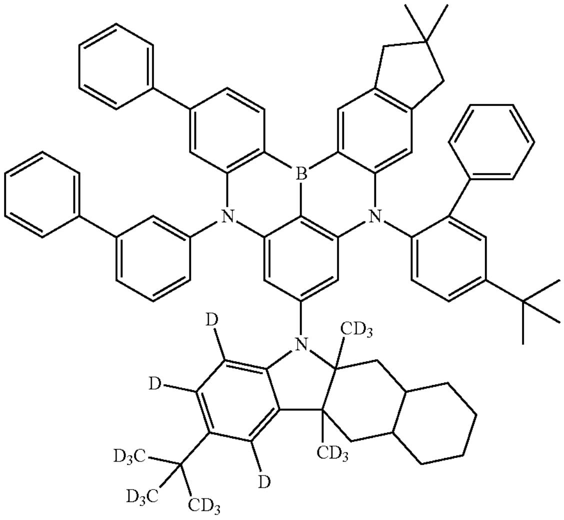
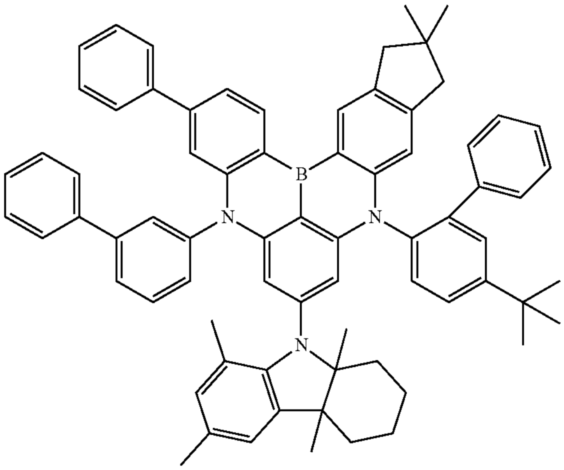

-continued
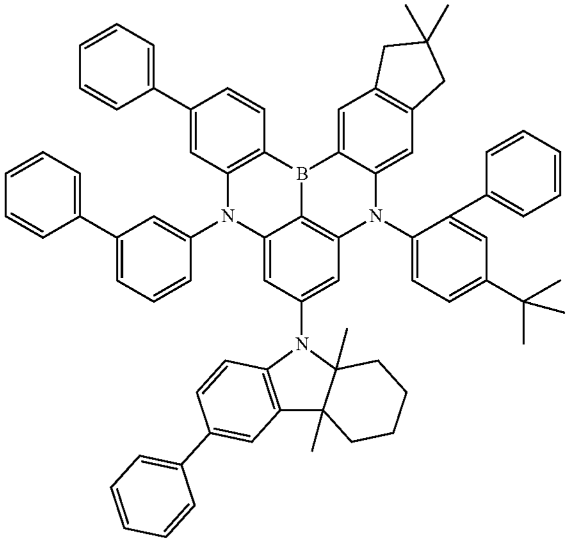
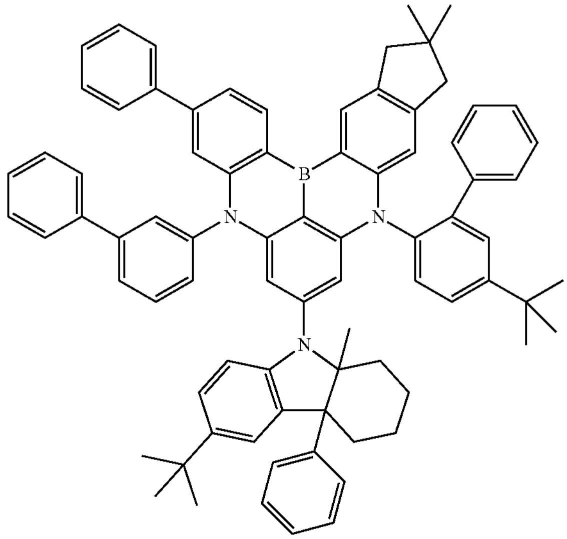
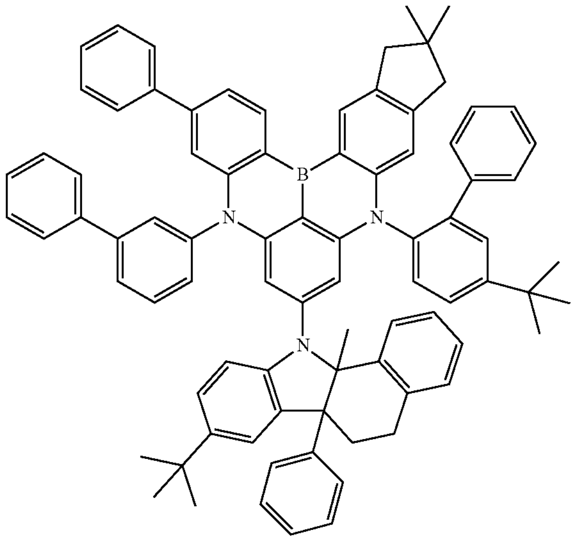
-continued
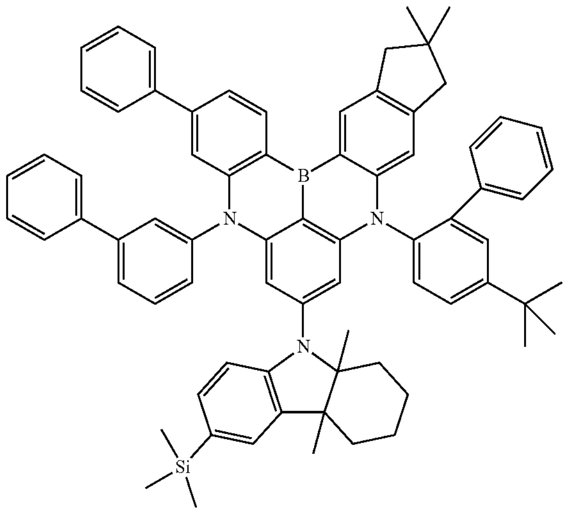
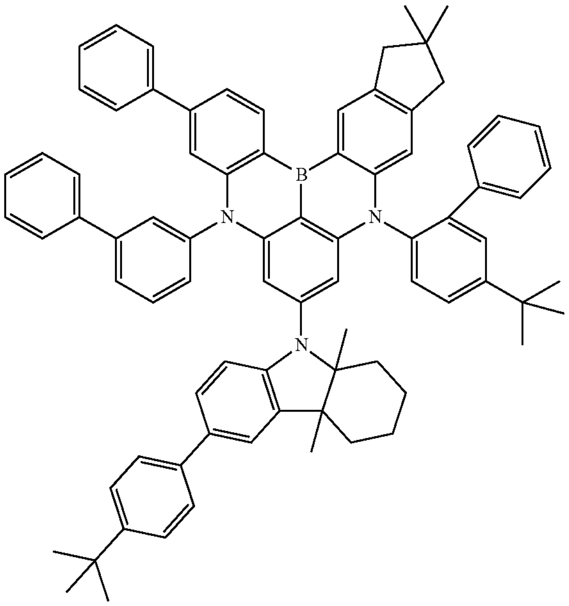
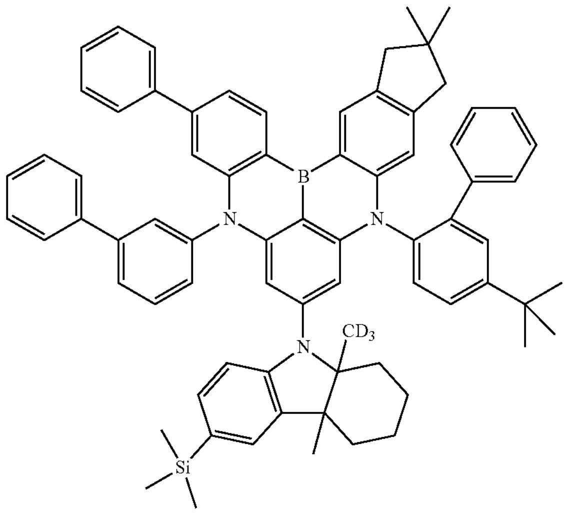

-continued
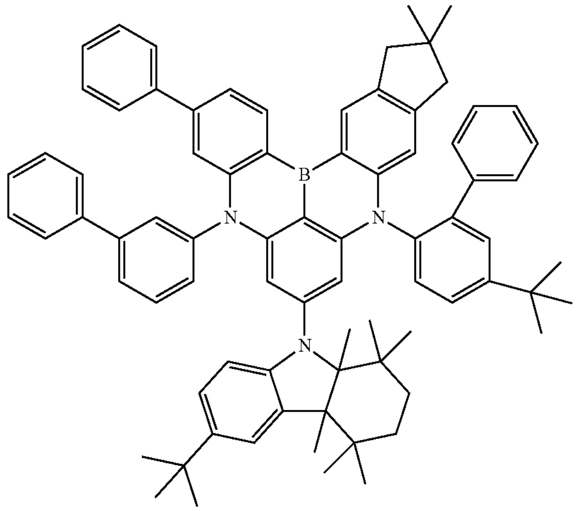
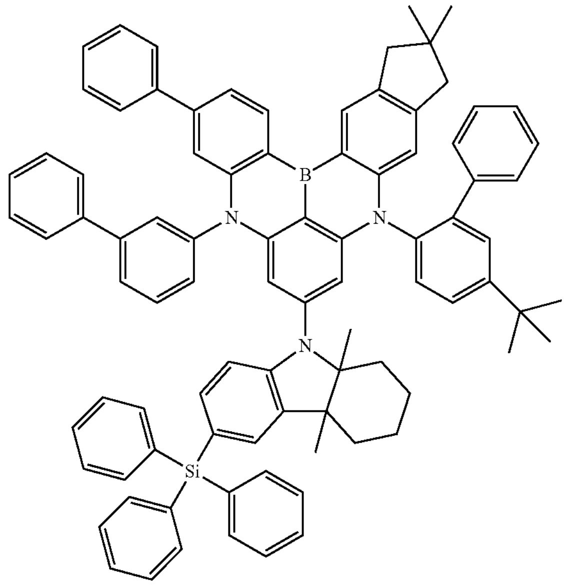
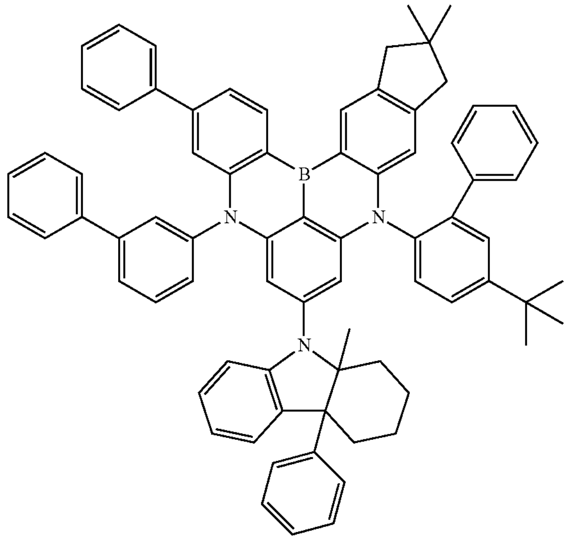
-continued
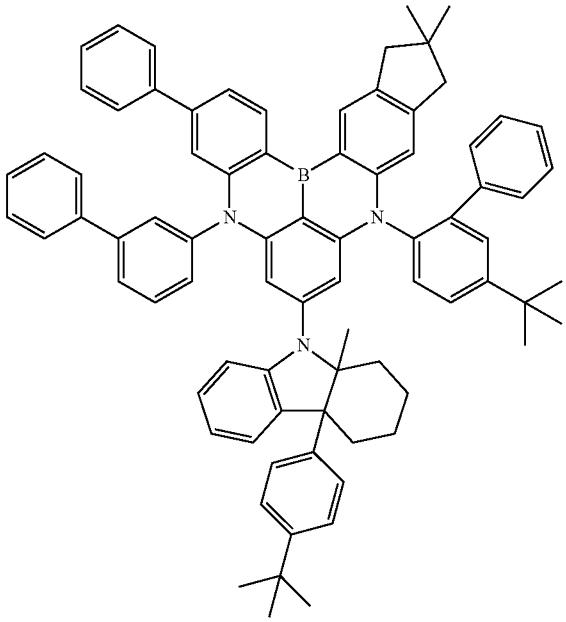
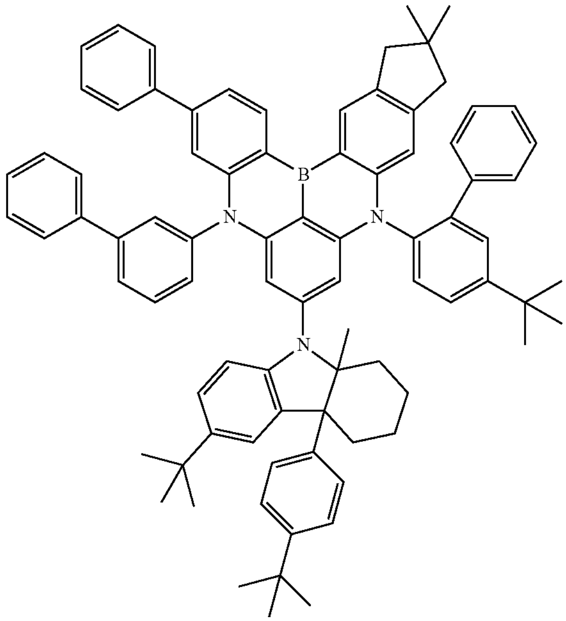

-continued
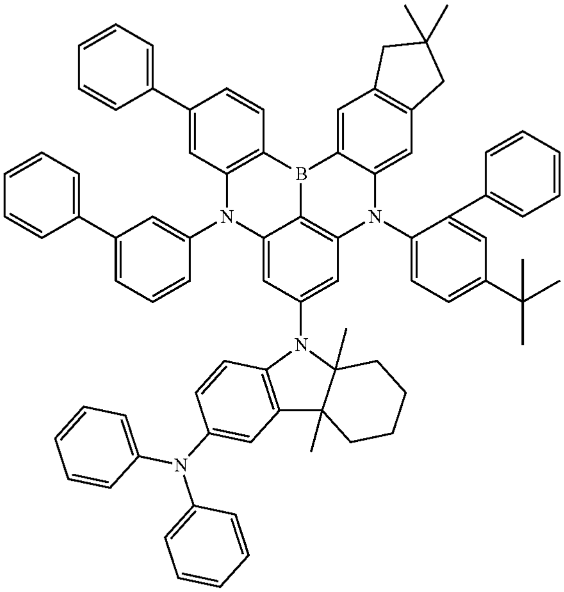
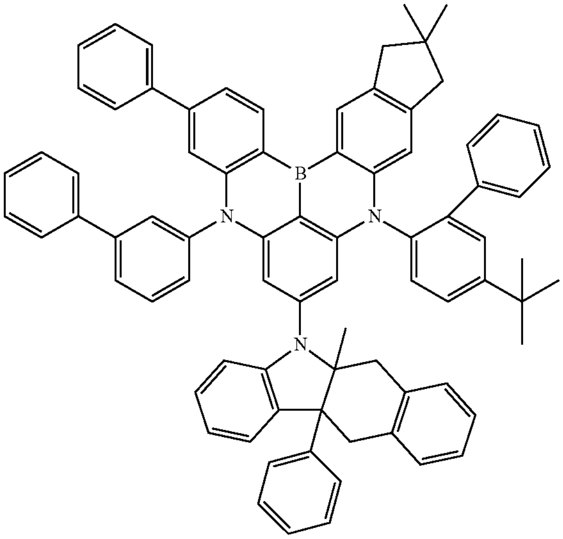
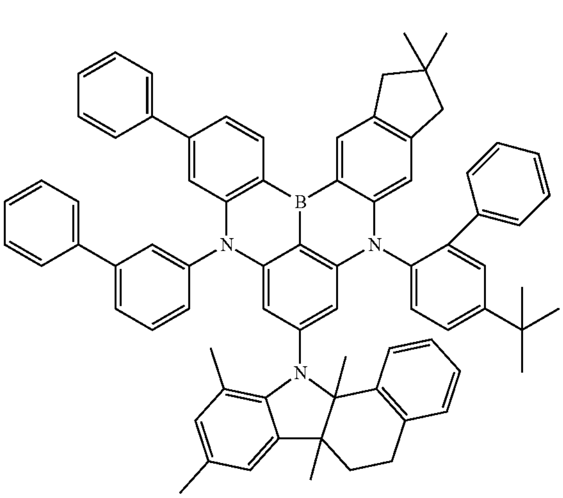
-continued
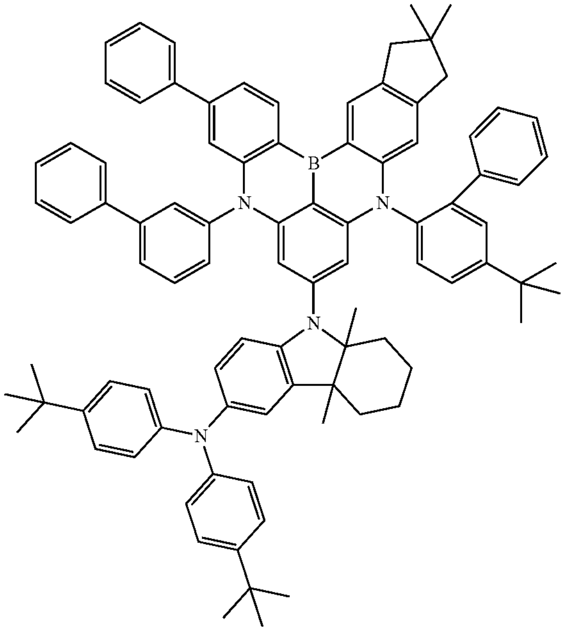
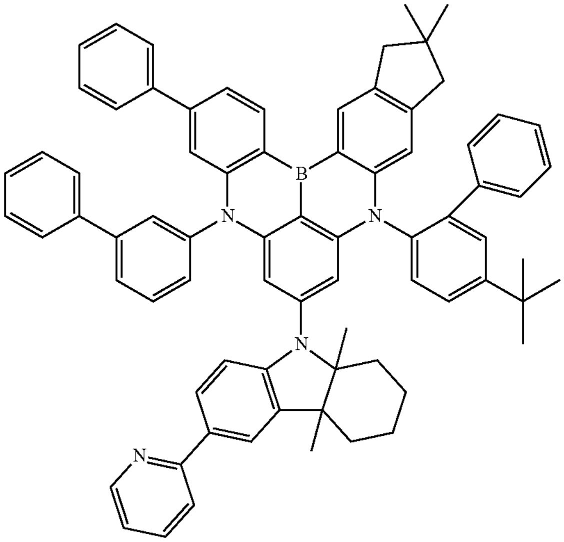
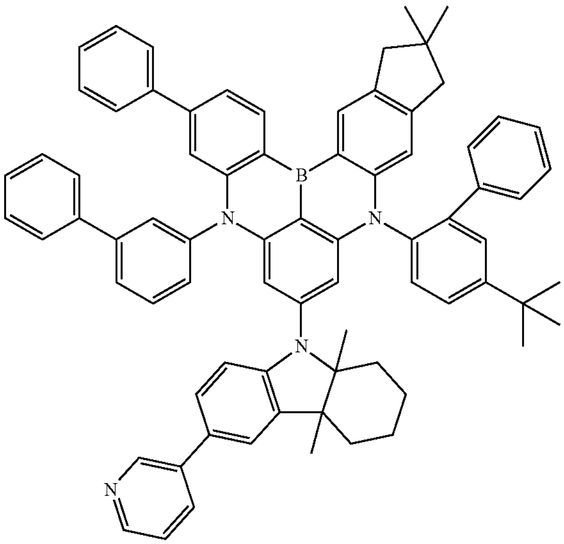

-continued
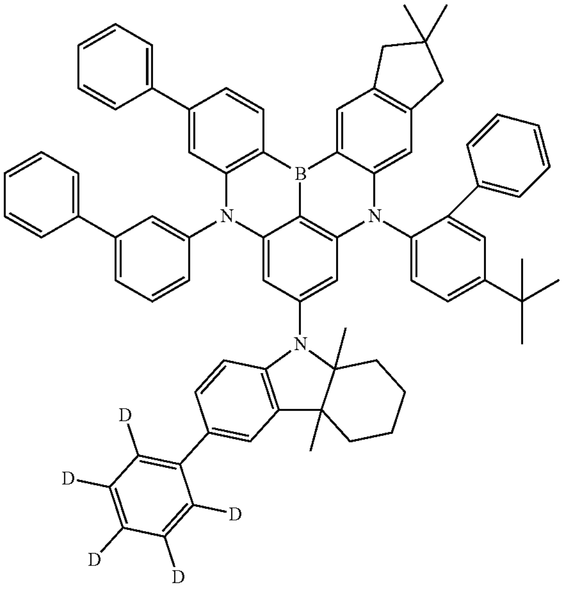
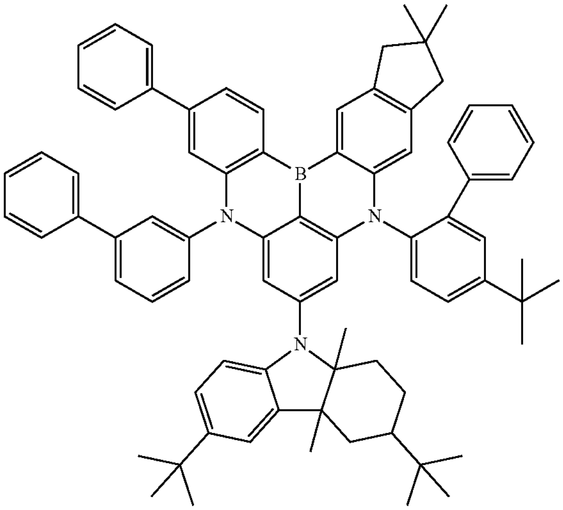
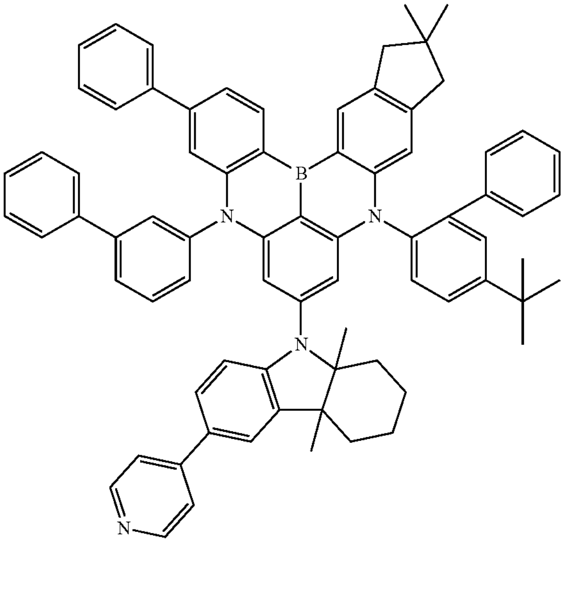
-continued
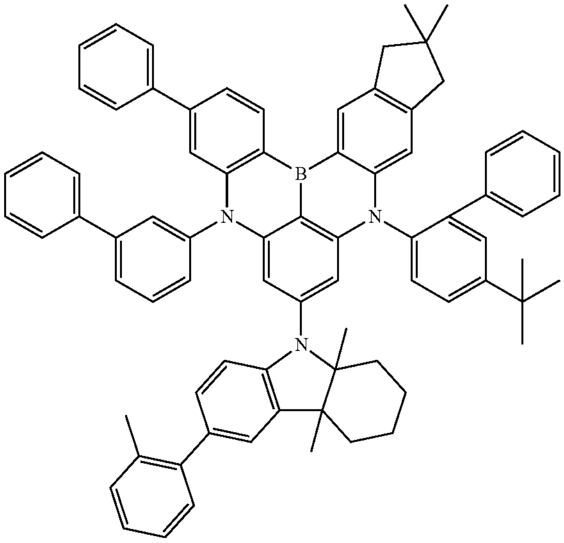
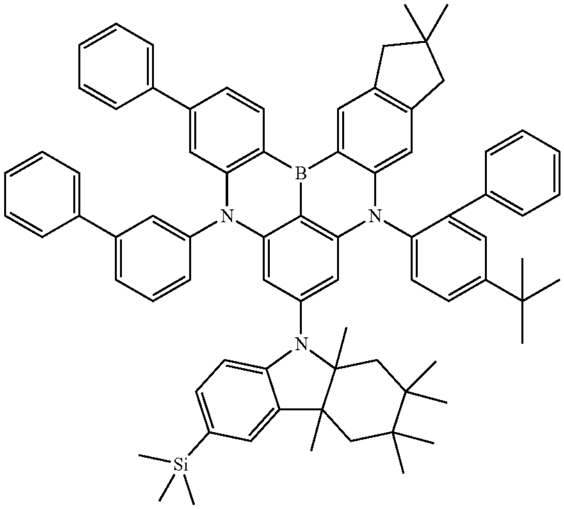
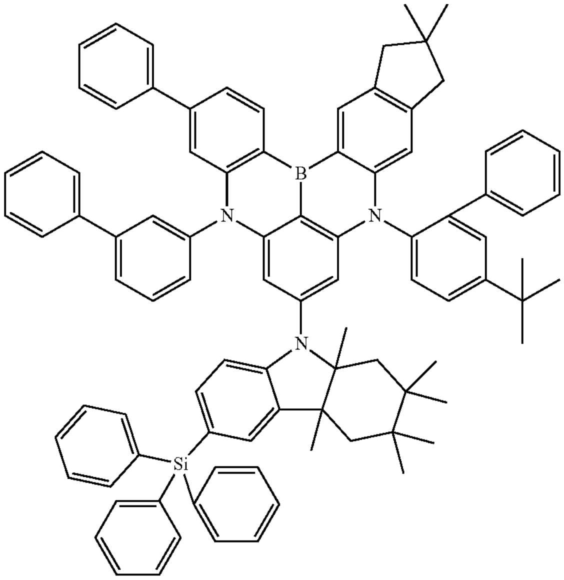

-continued
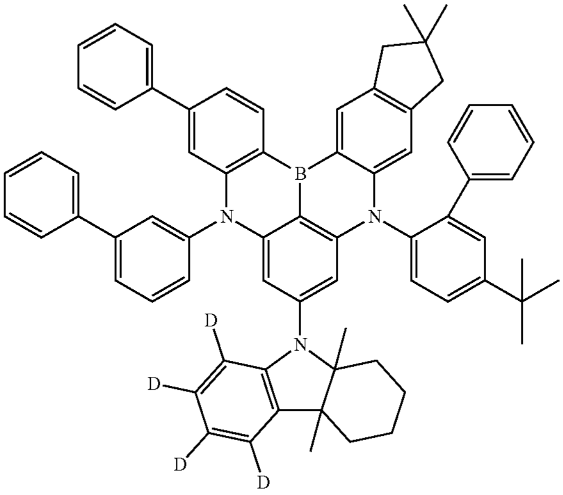
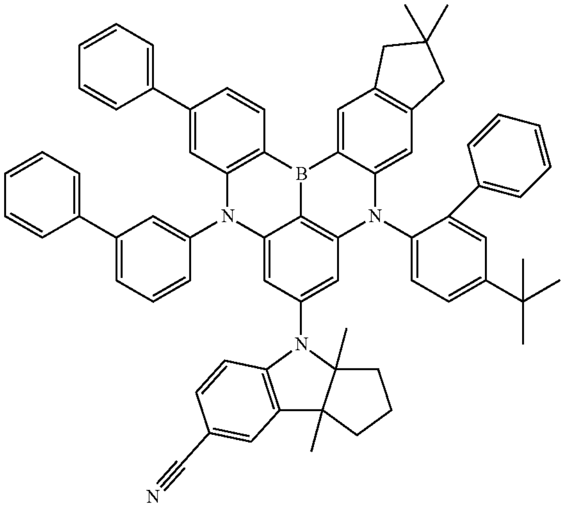
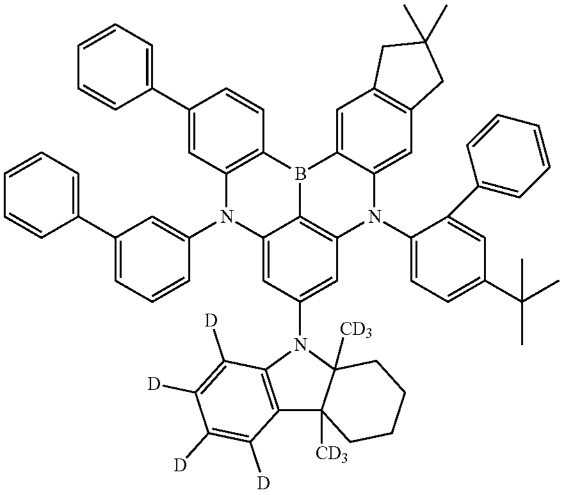
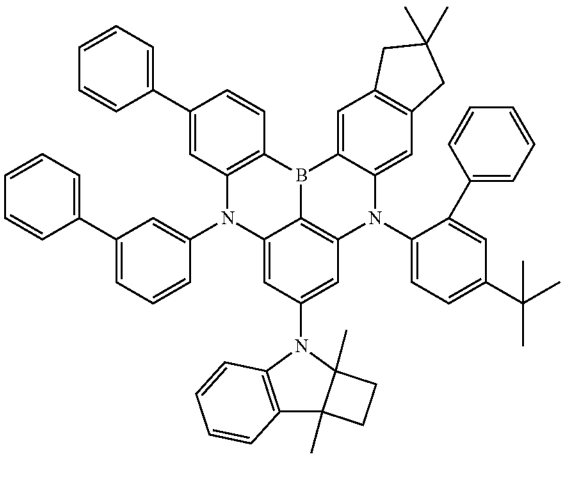
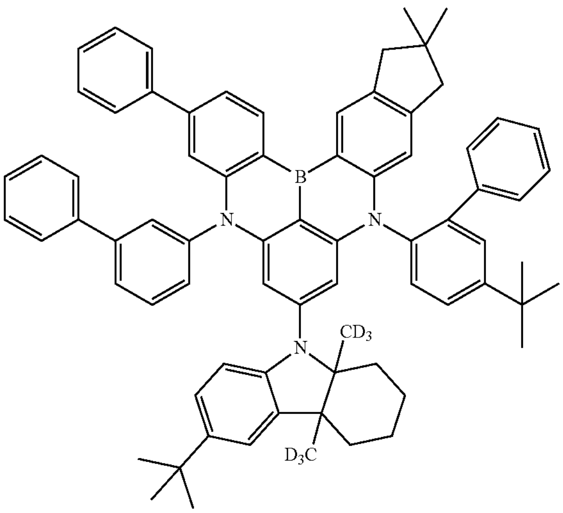
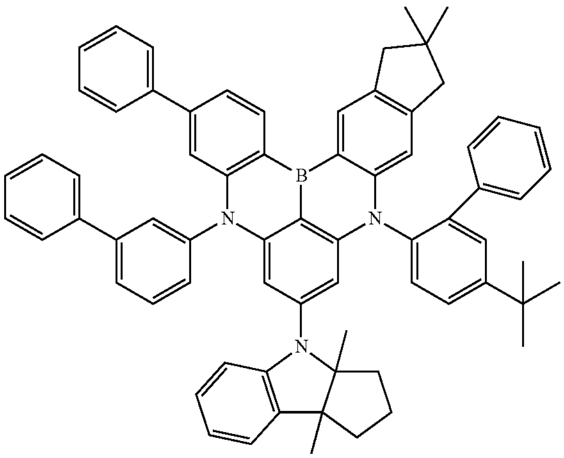

-continued
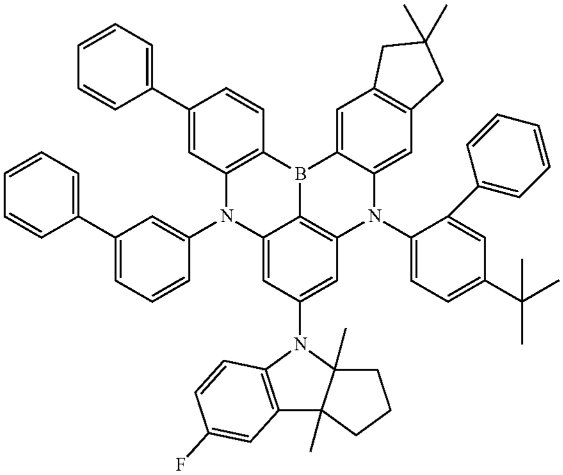
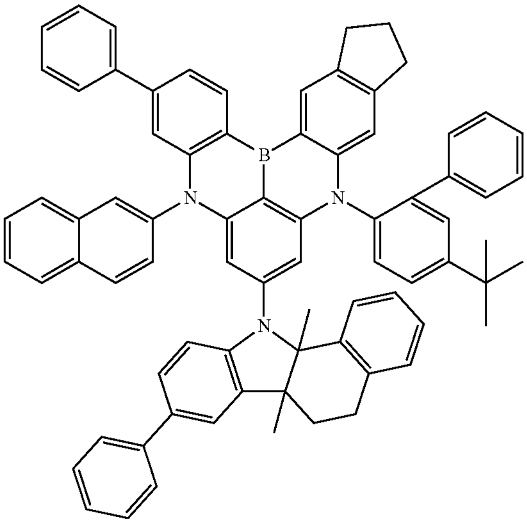
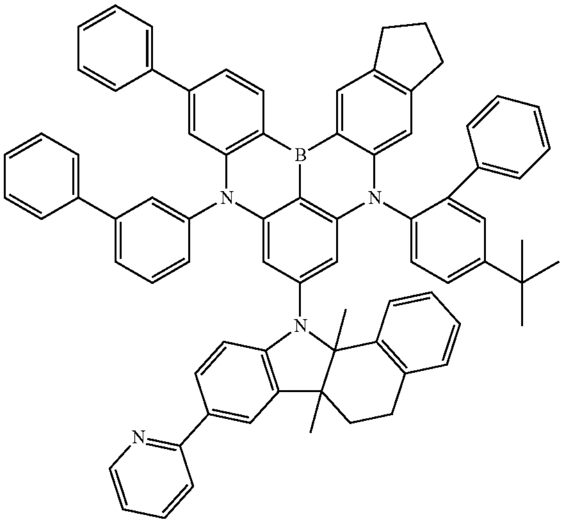
-continued
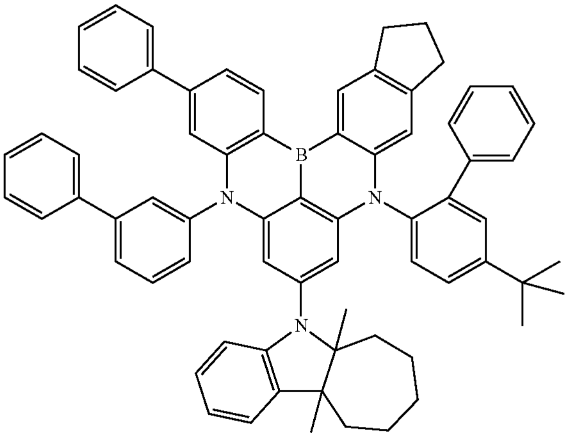
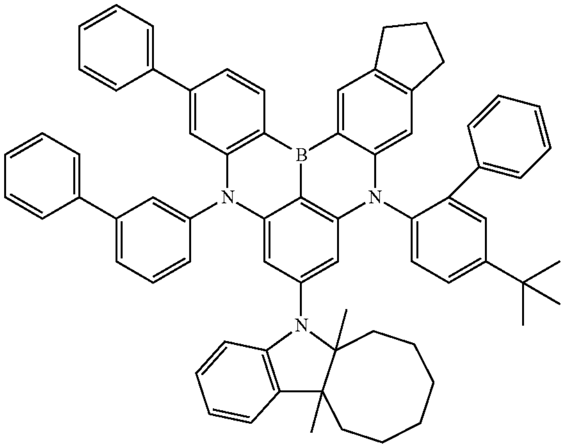
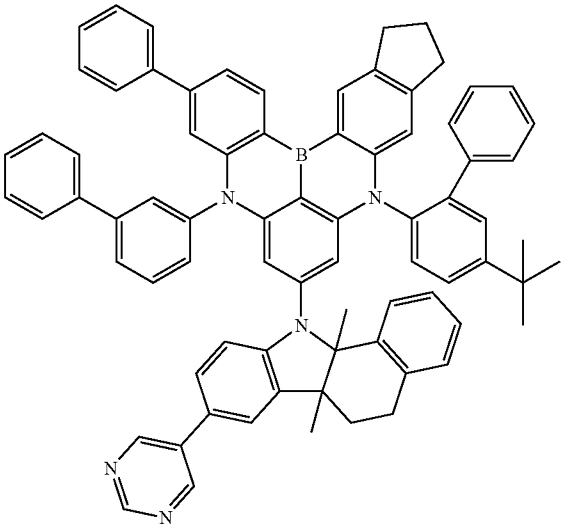

-continued
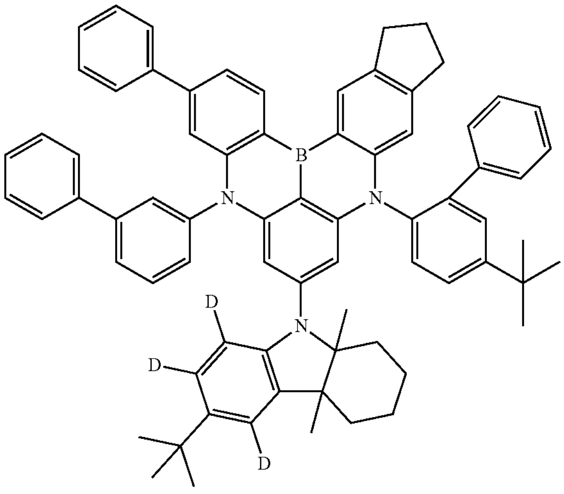
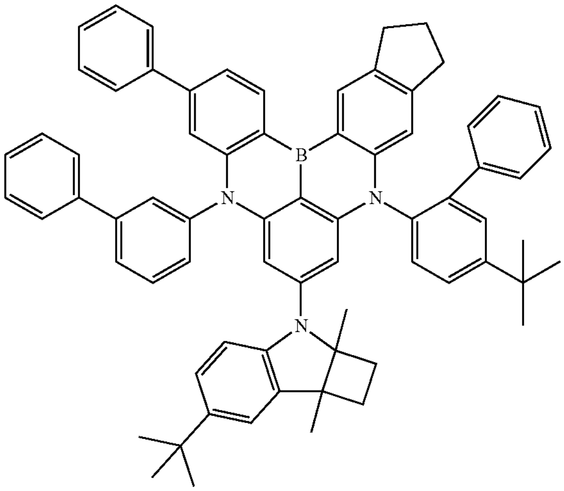
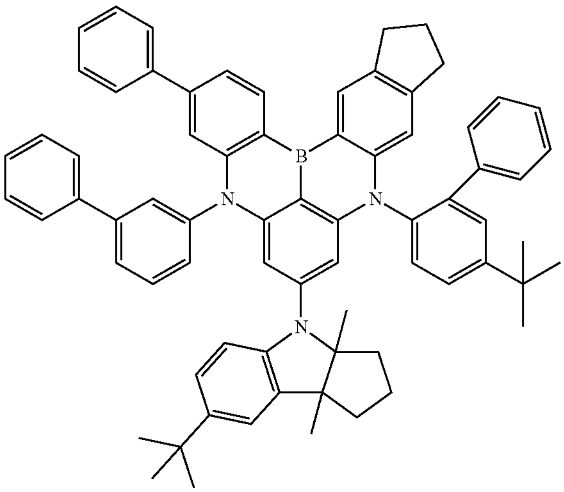
-continued
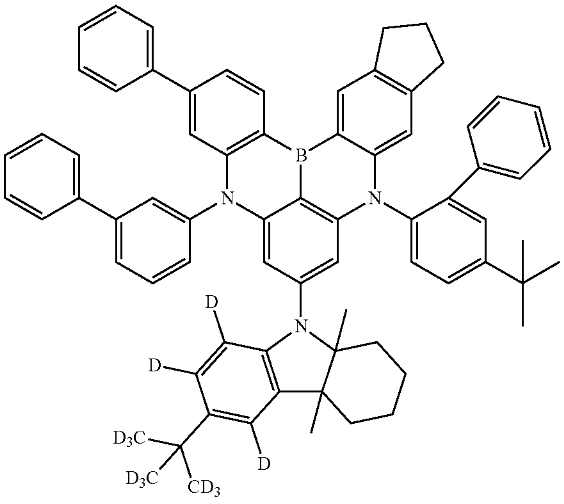
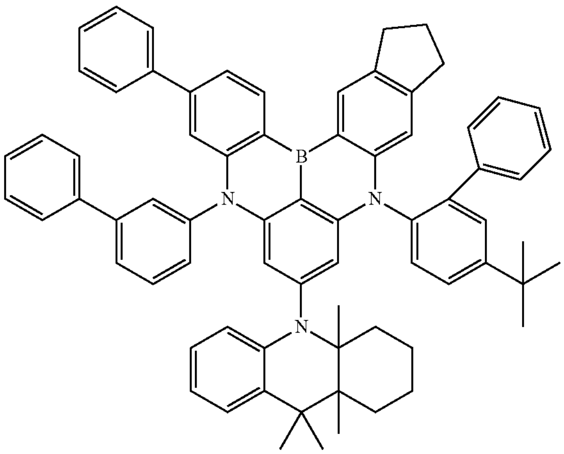
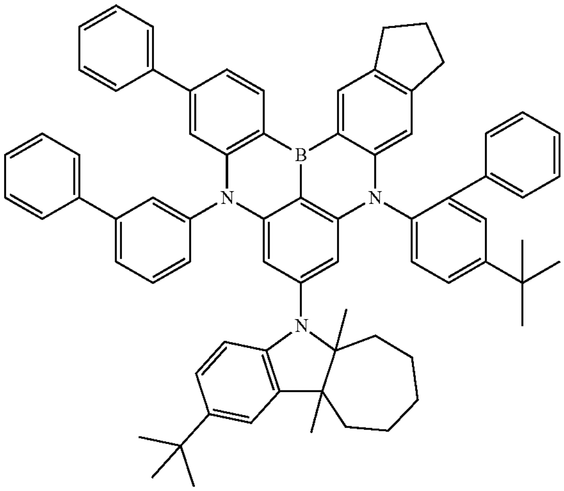

-continued
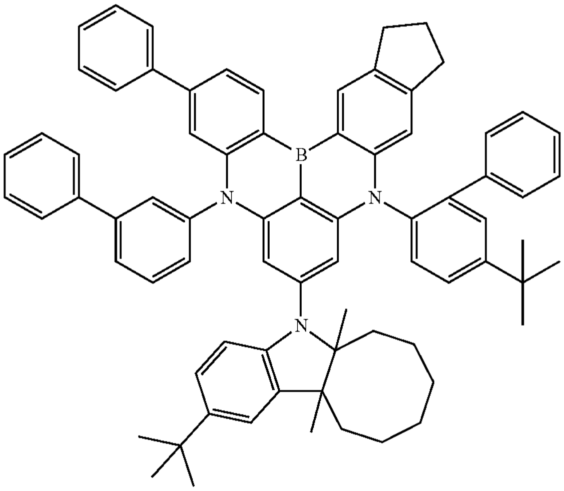
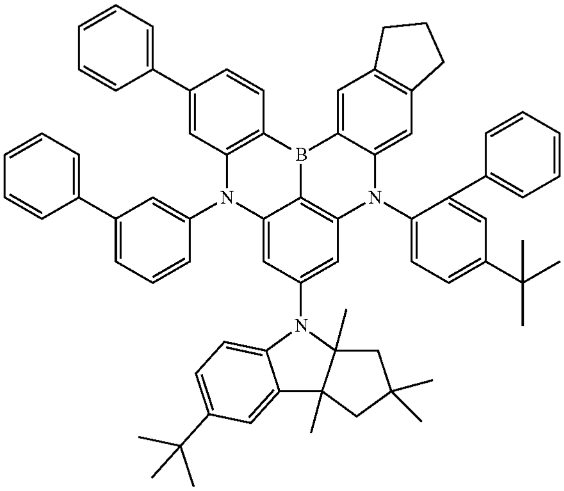
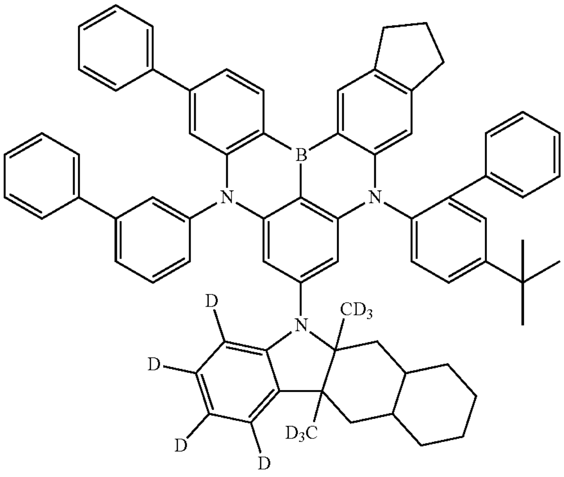
-continued
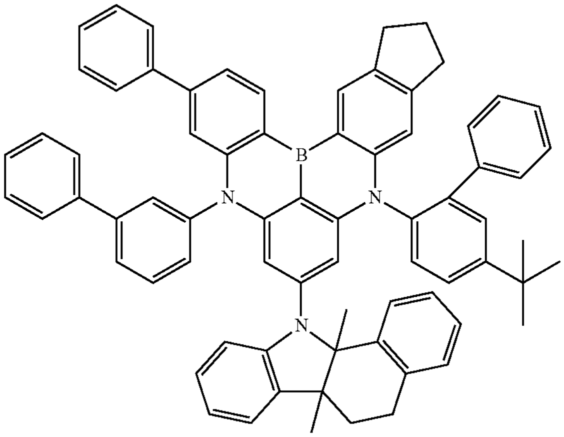
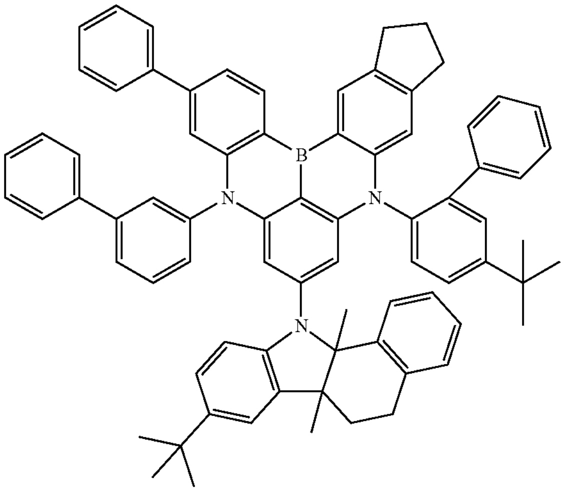 [SMILES: CC(C)(C)c1ccc(N2c3cc4c(cc3B3c5ccc(-c6ccccc6)cc5N(c5cccc(-c6ccccc6)c5)c5cc(N6c7ccc(C(C)(C)C)cc7C7(C)CCc8ccccc8C67C)cc2c53)CCC4)c(-c2ccccc2)c1]
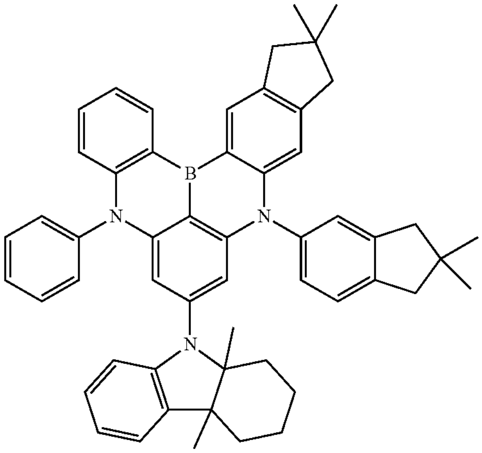

-continued
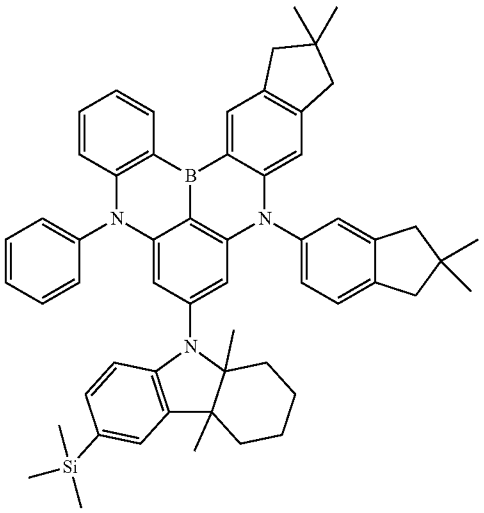
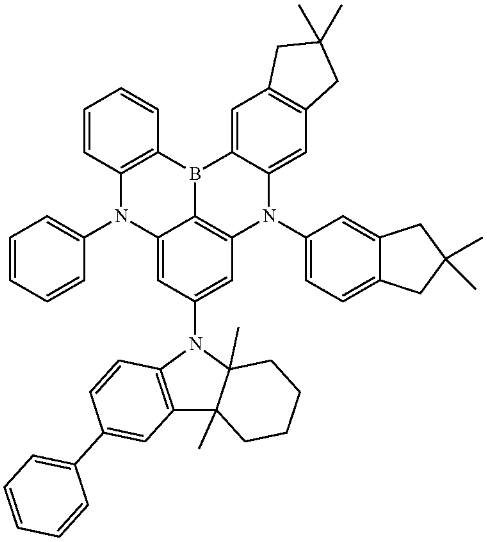
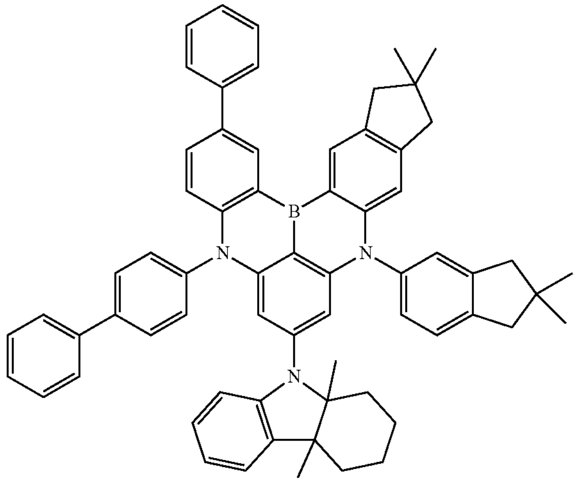
-continued
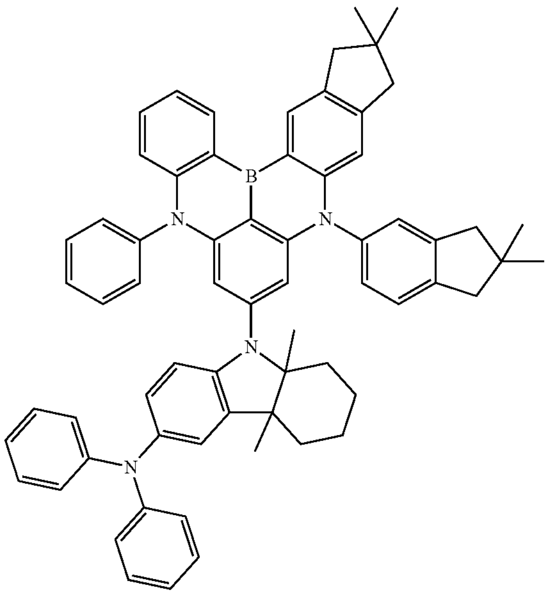
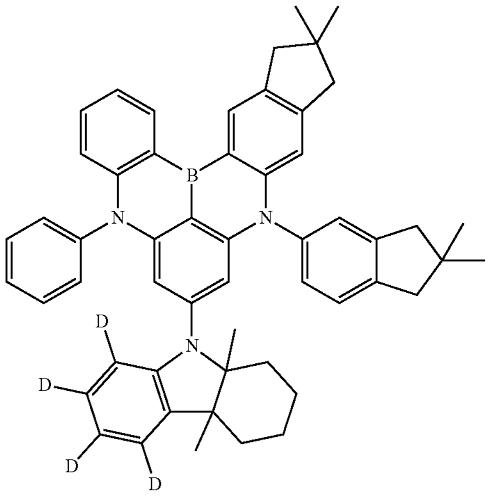
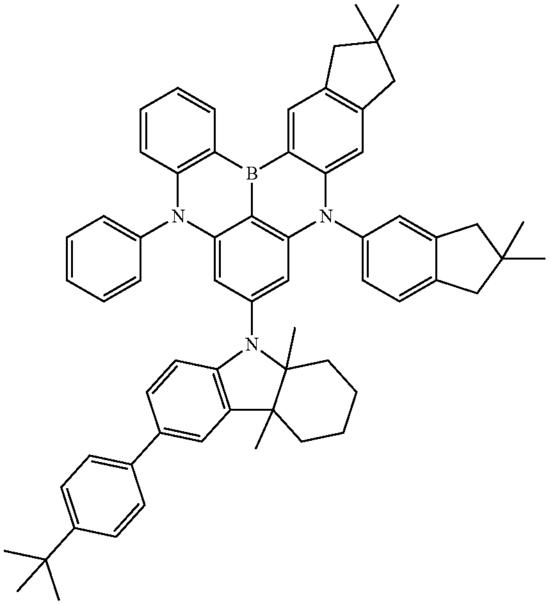

-continued
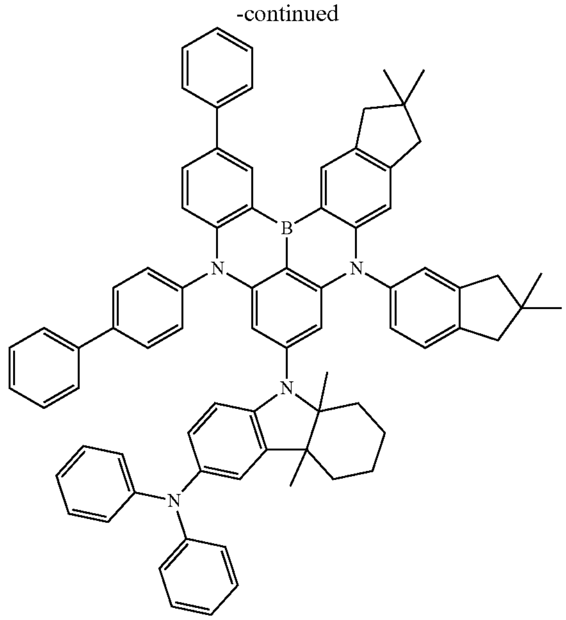
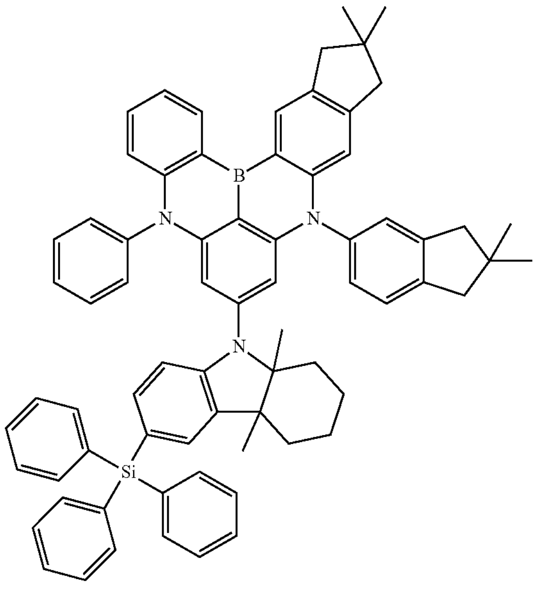
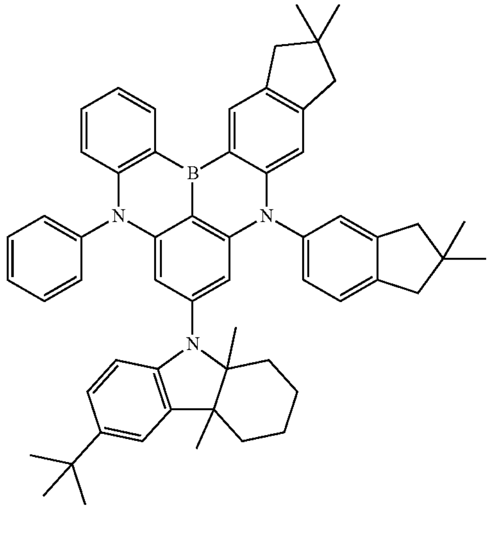
-continued
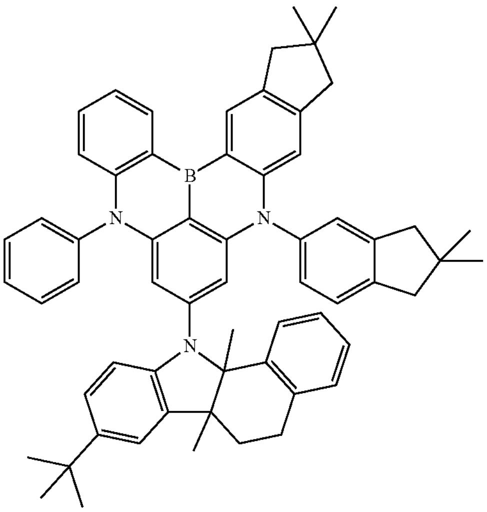
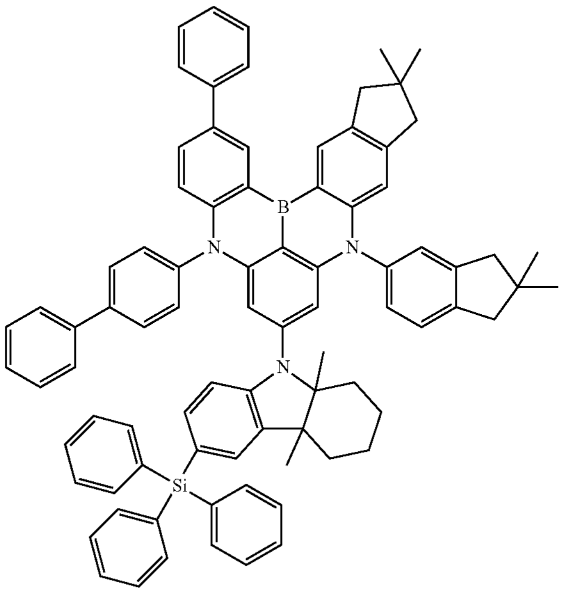
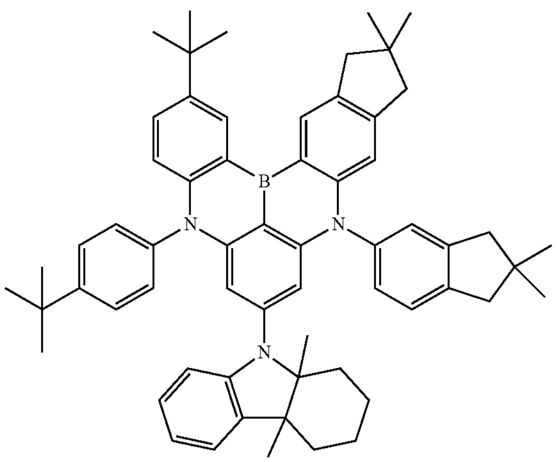

-continued
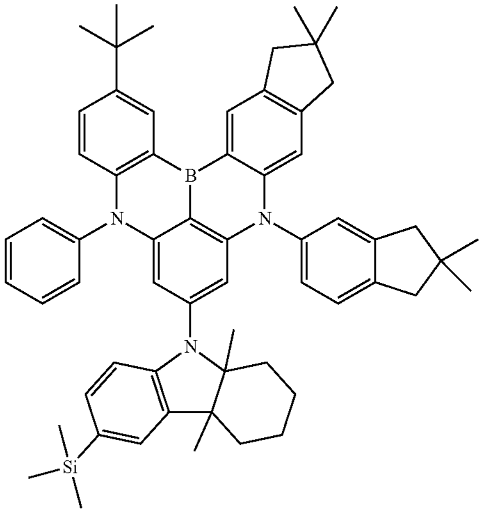
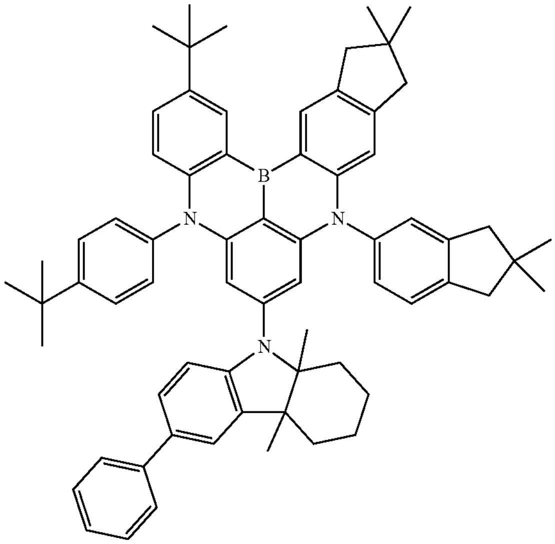
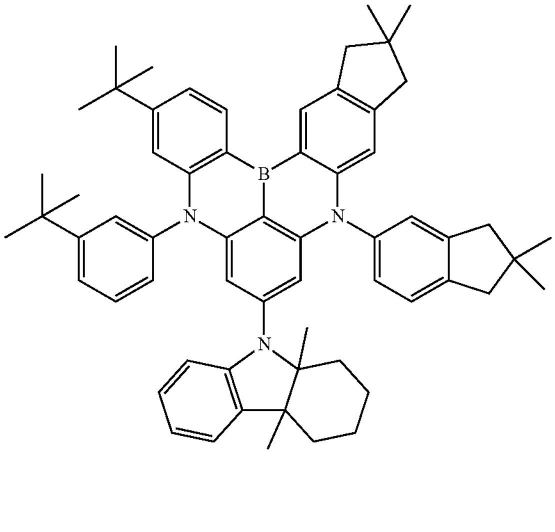
-continued
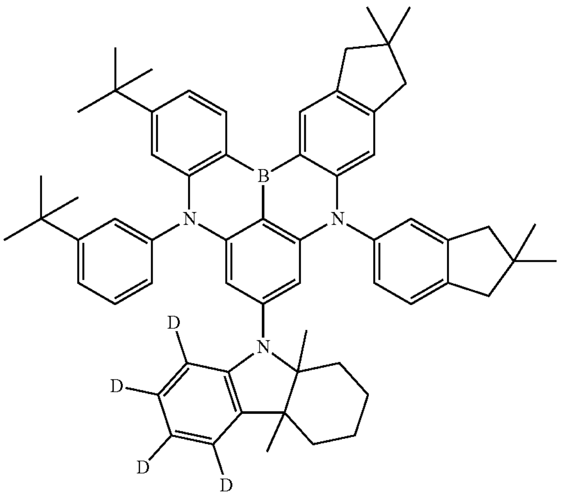
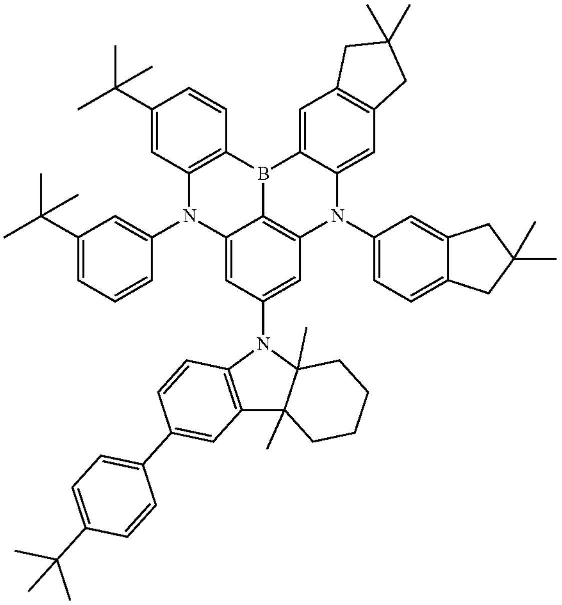
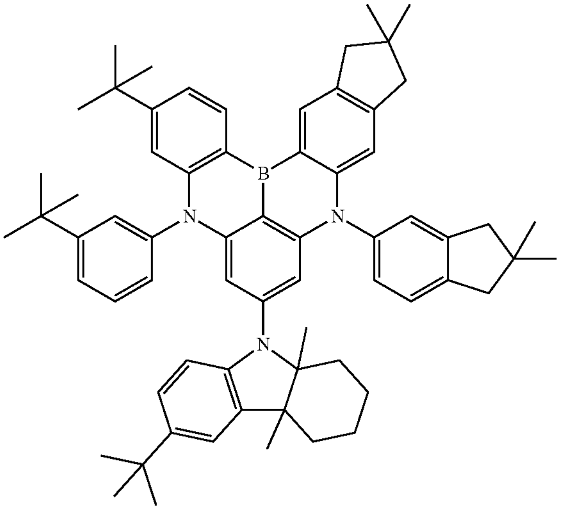

-continued
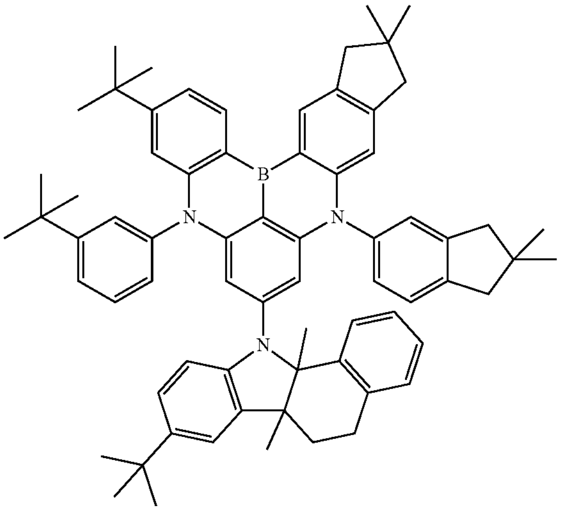
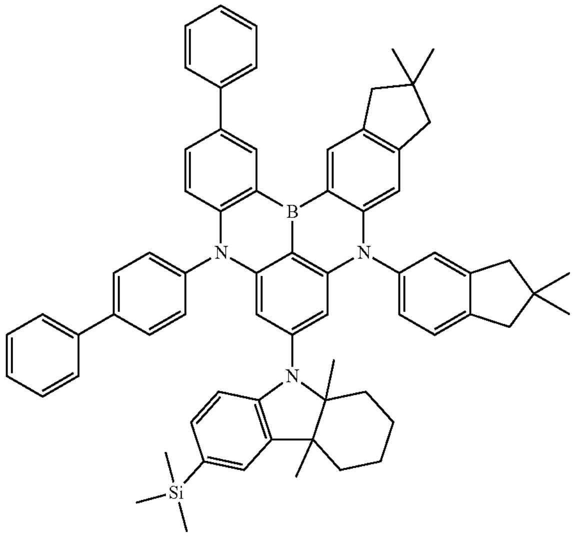
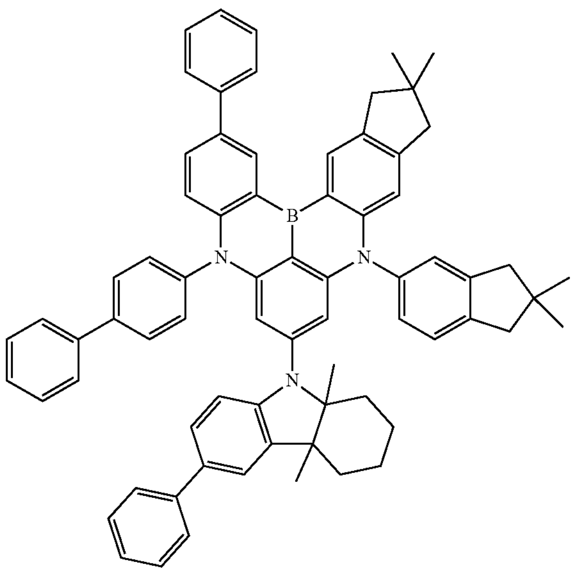
-continued
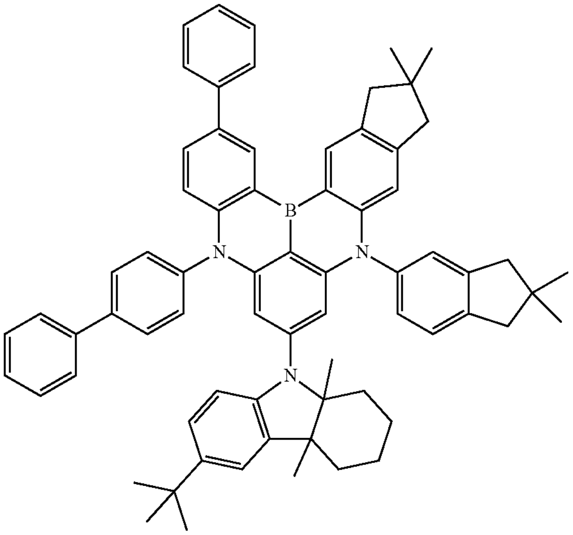
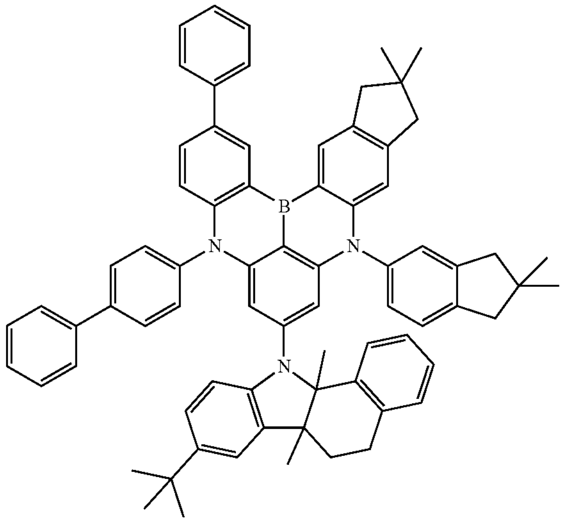
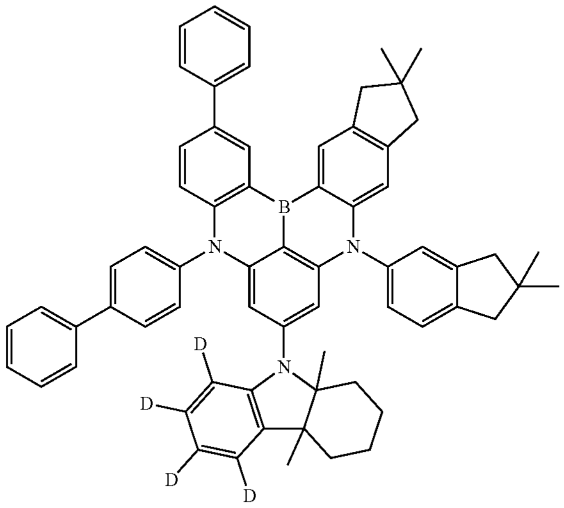

-continued
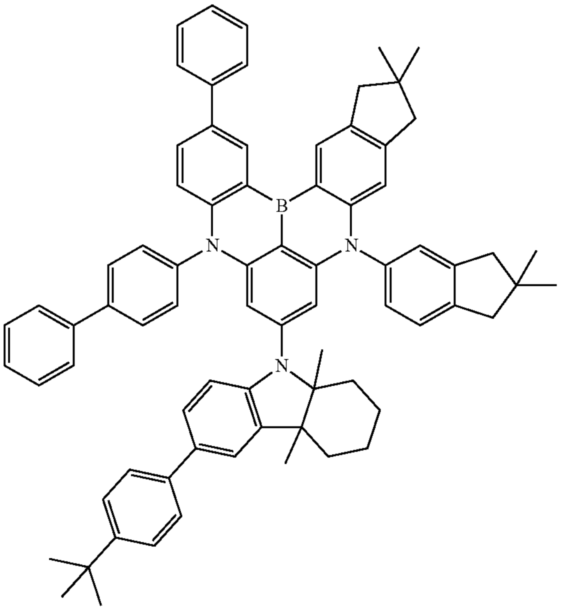
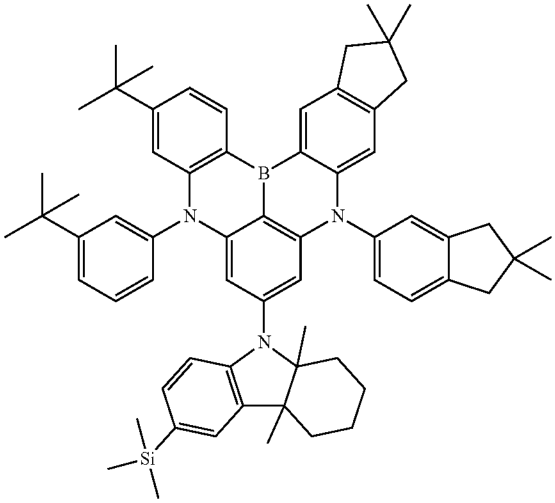
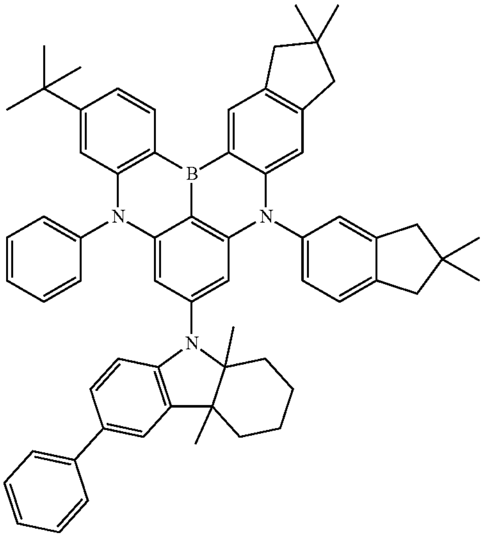
-continued
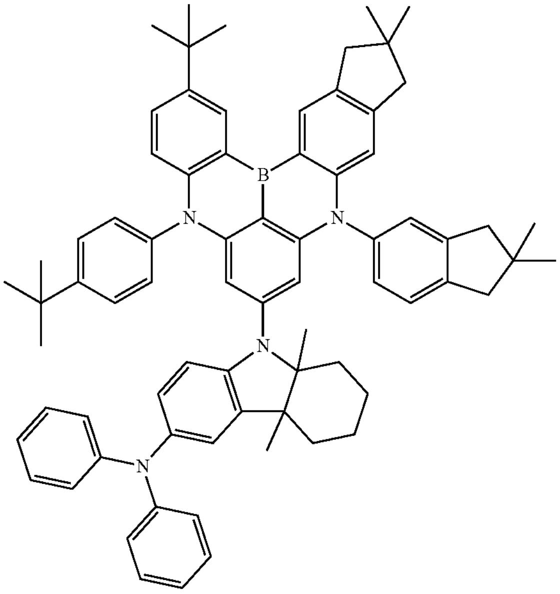
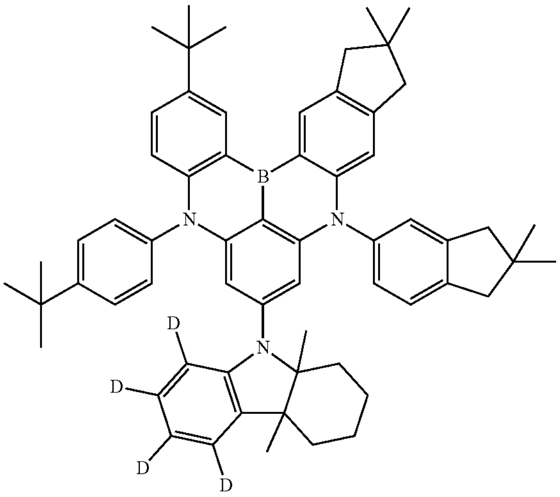
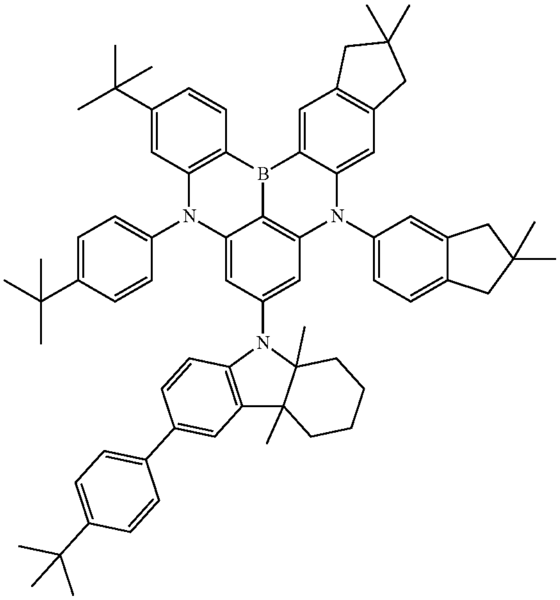

-continued
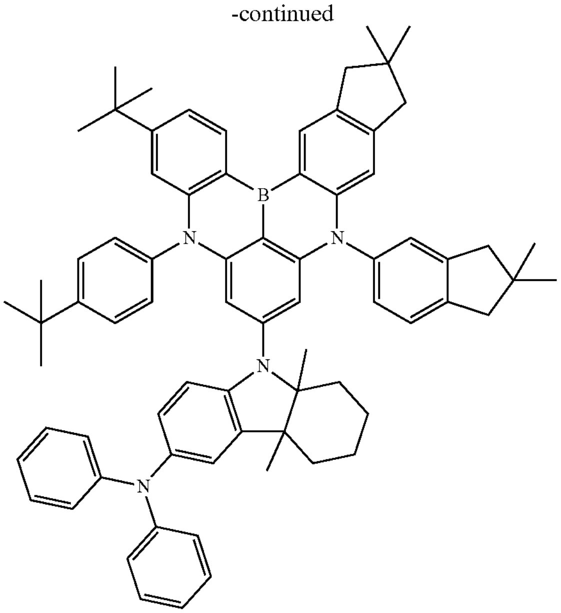
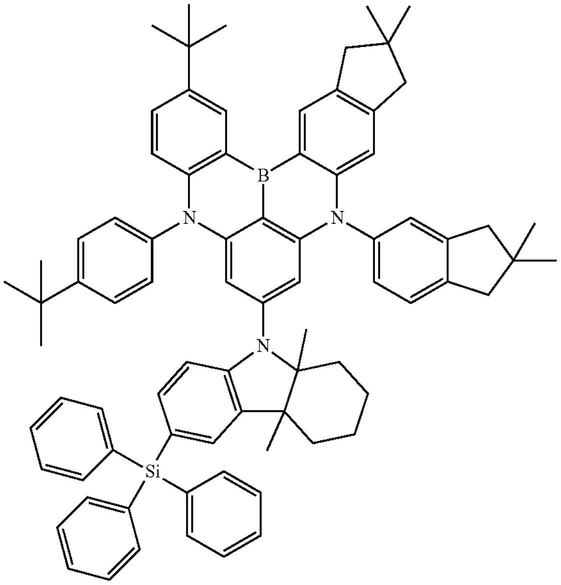
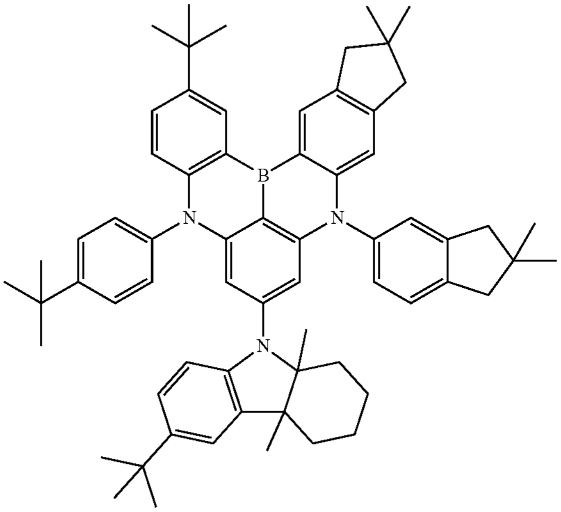
-continued
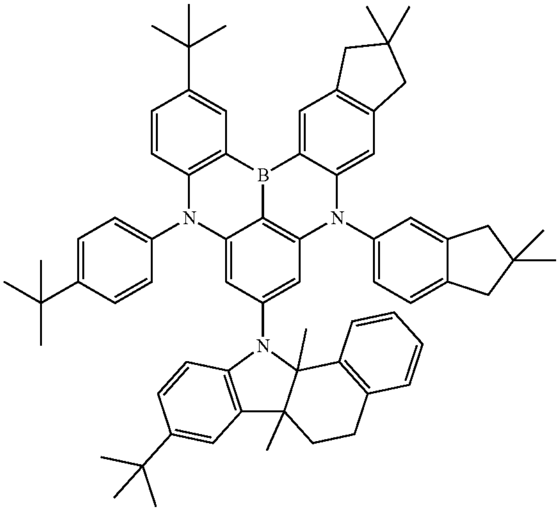
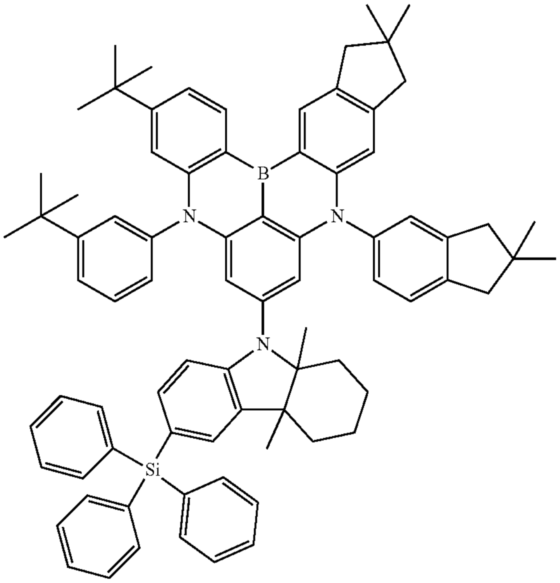
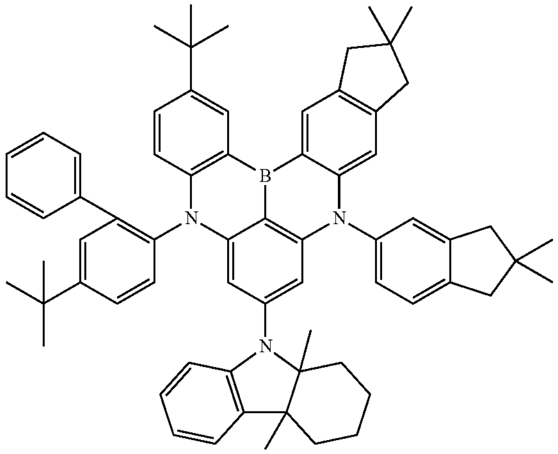

-continued
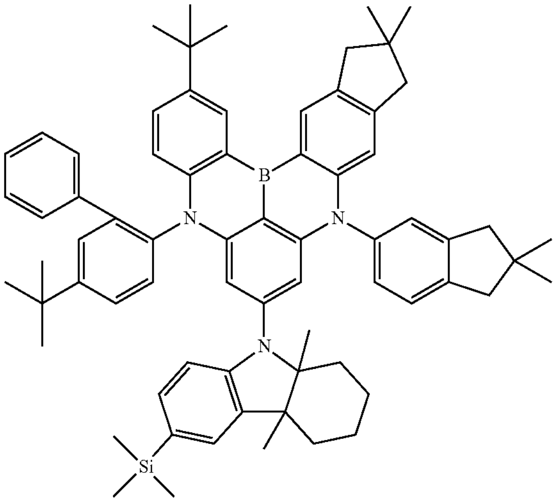
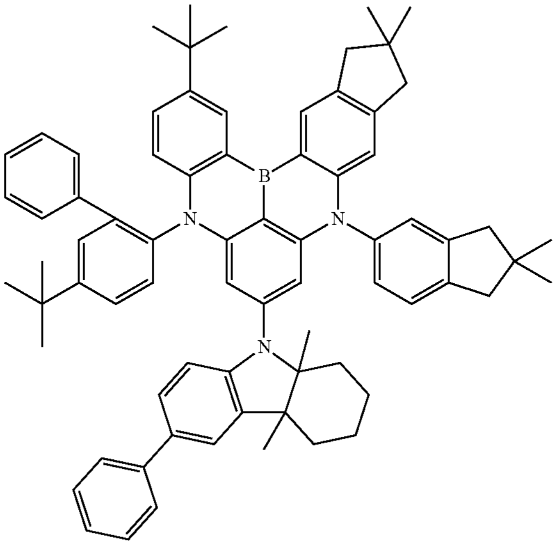
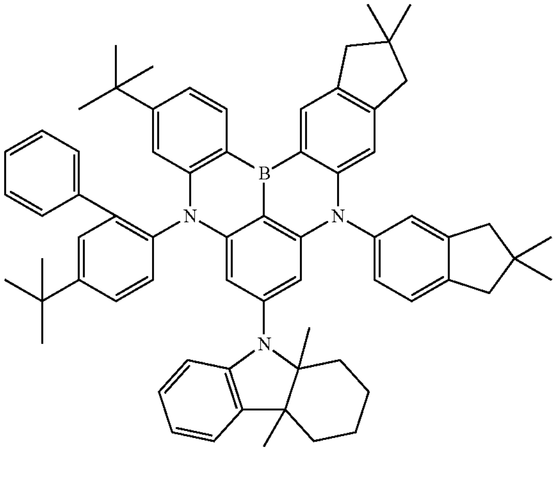
-continued
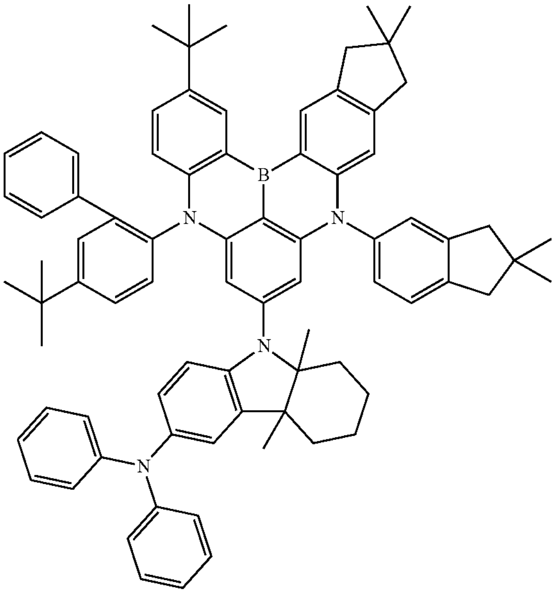
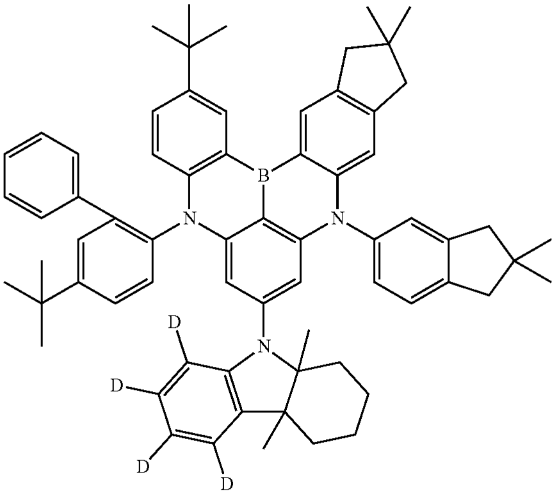
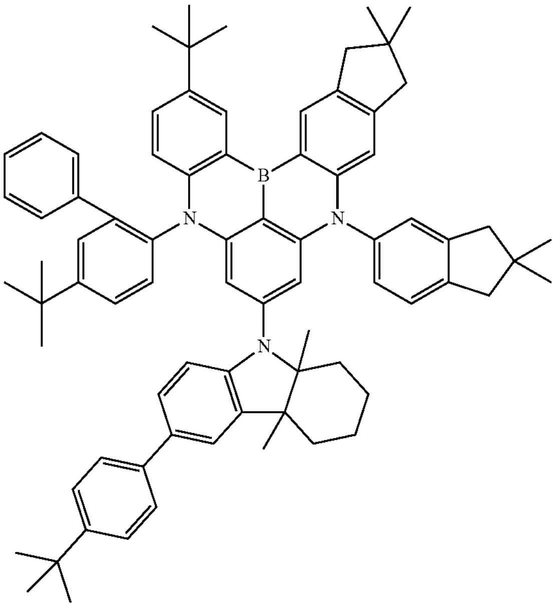

-continued
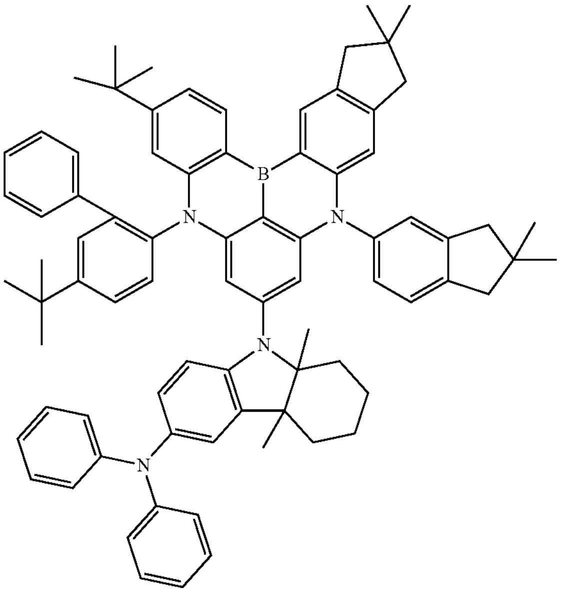
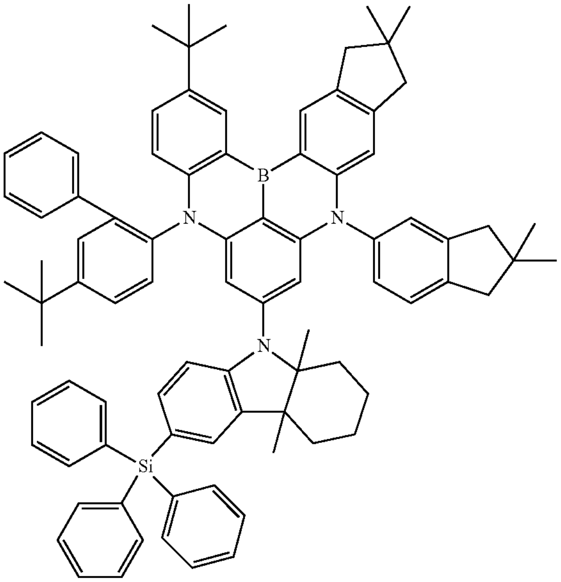
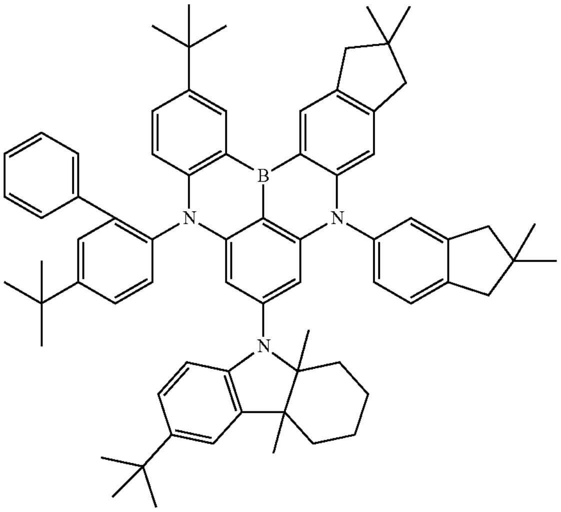
-continued
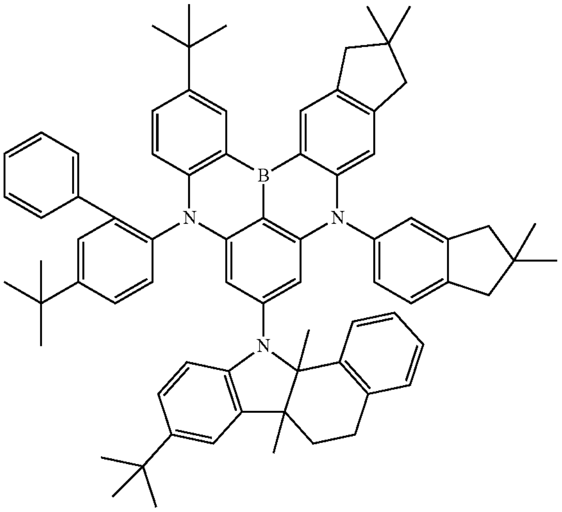
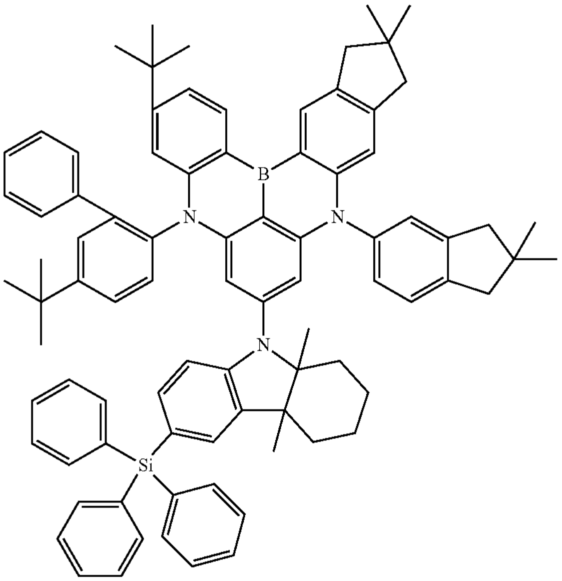
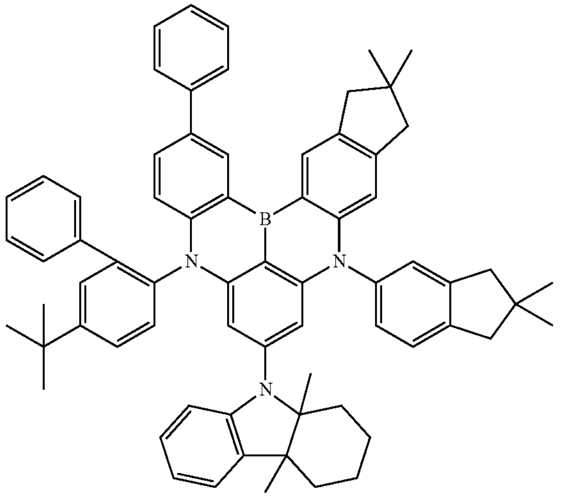

-continued
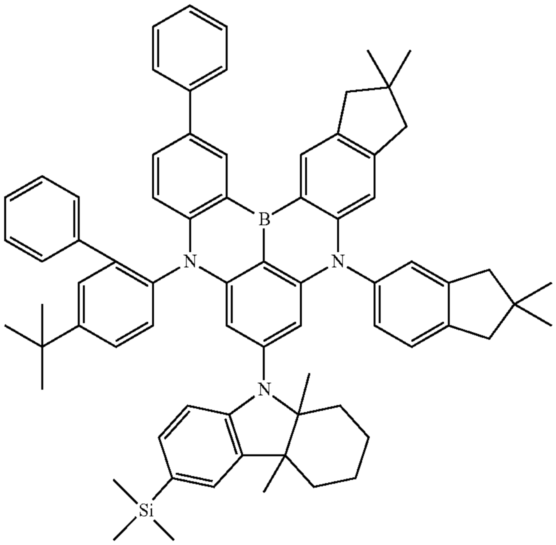
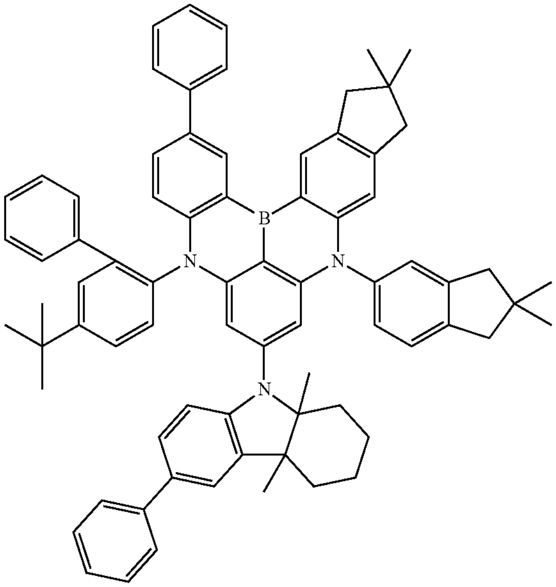
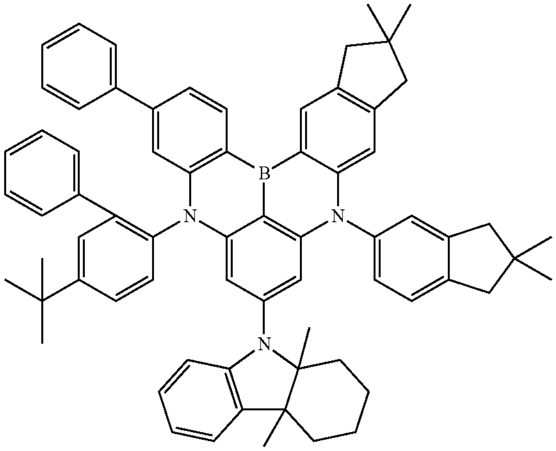
-continued
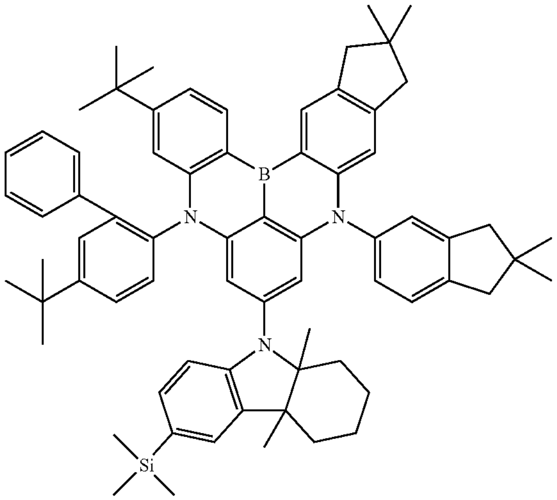
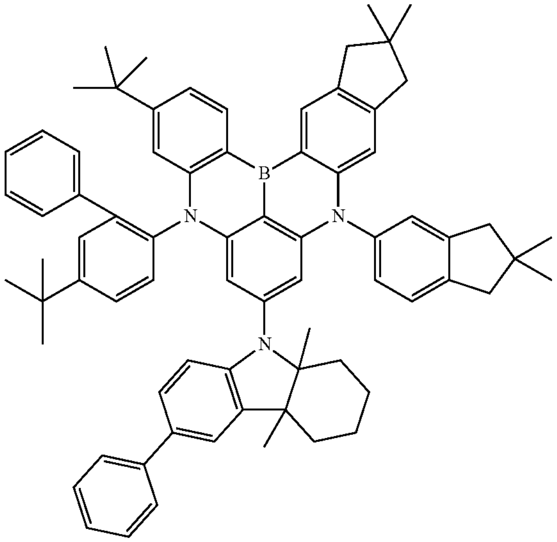
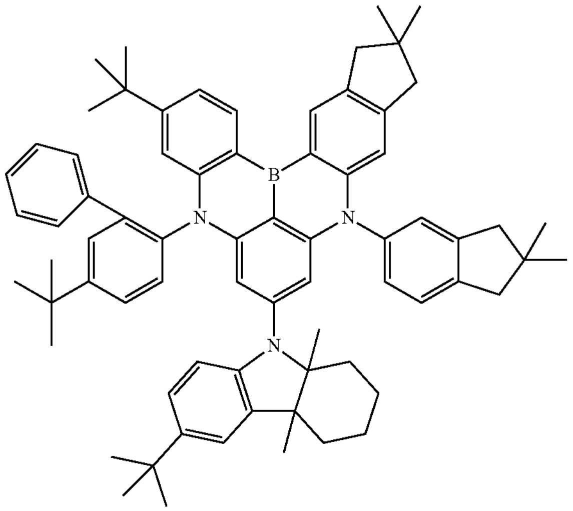

-continued
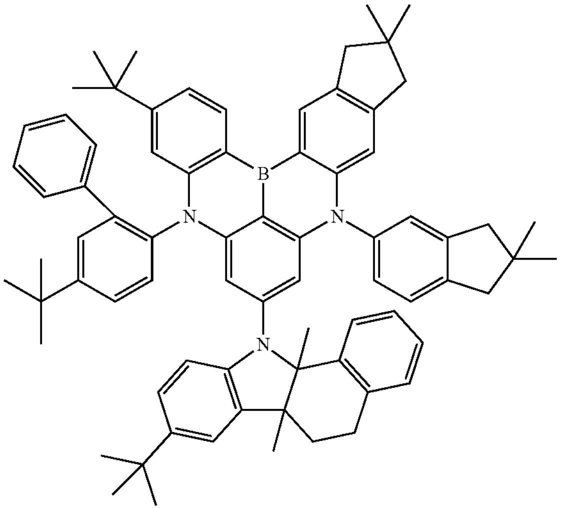
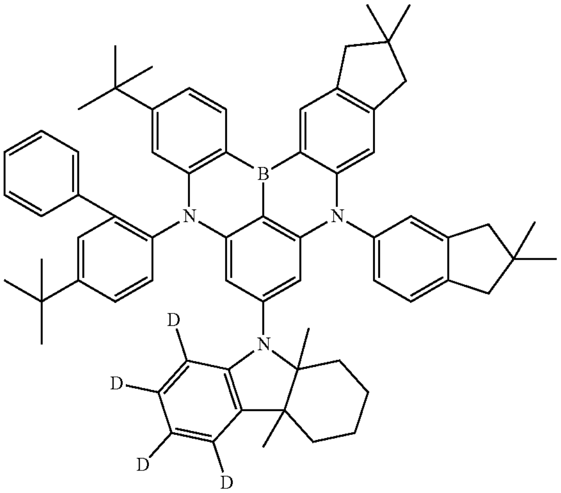
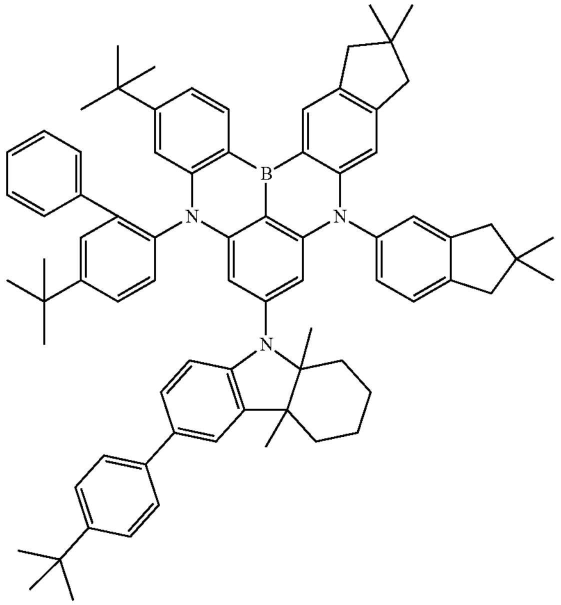
-continued
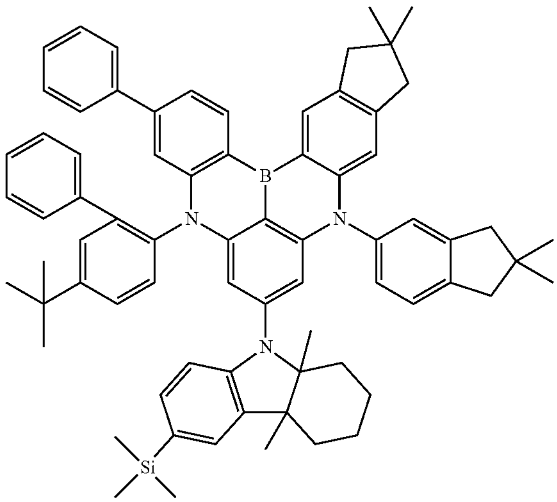
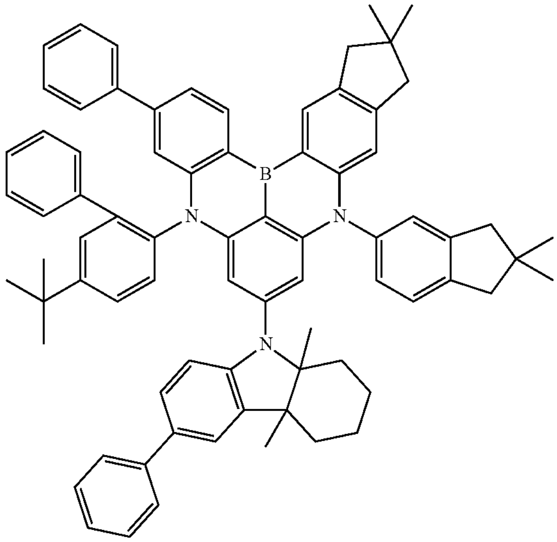
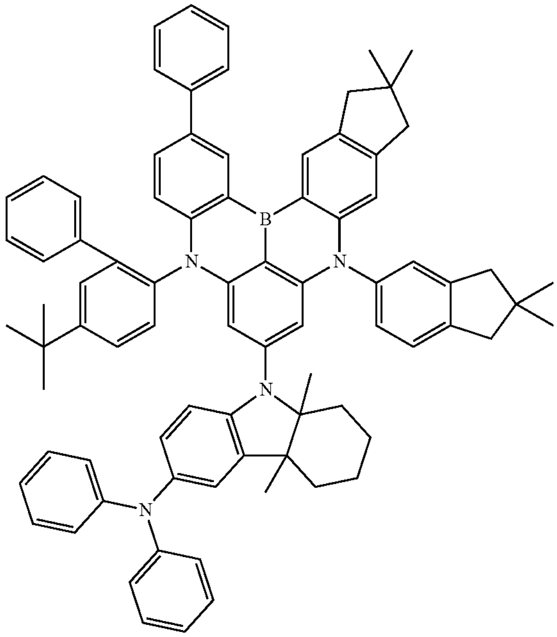

-continued
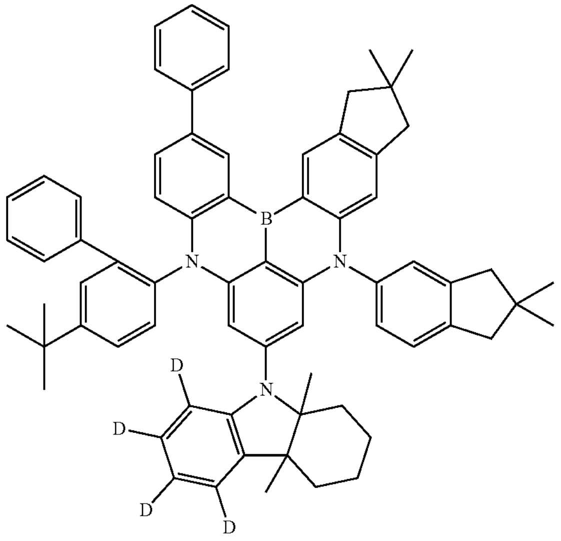
-continued
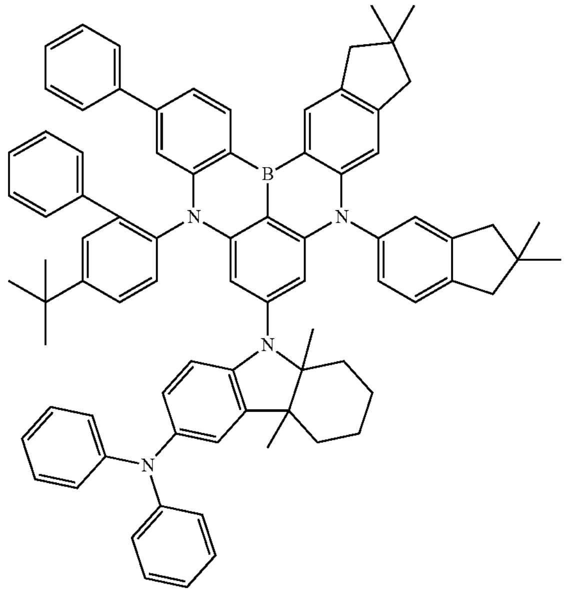
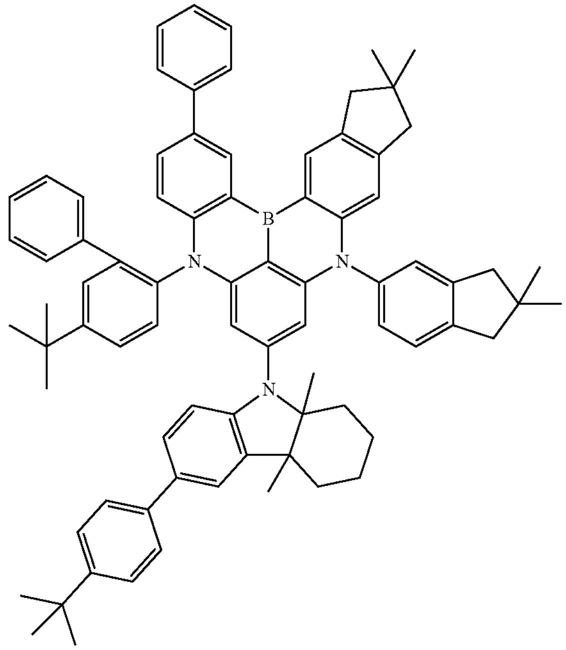
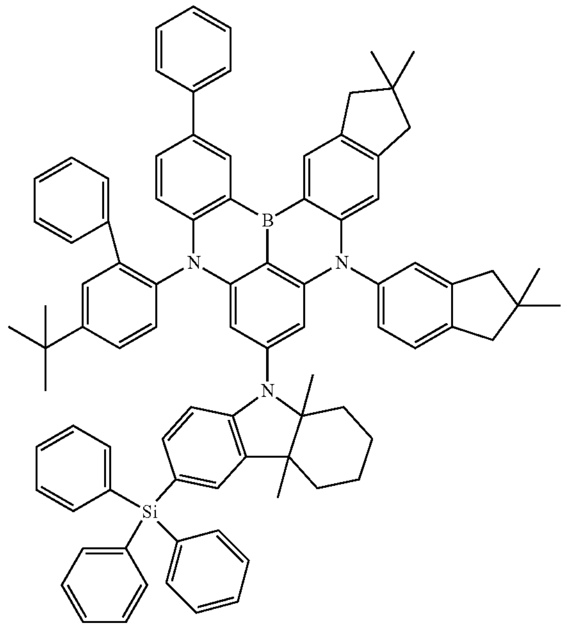

-continued
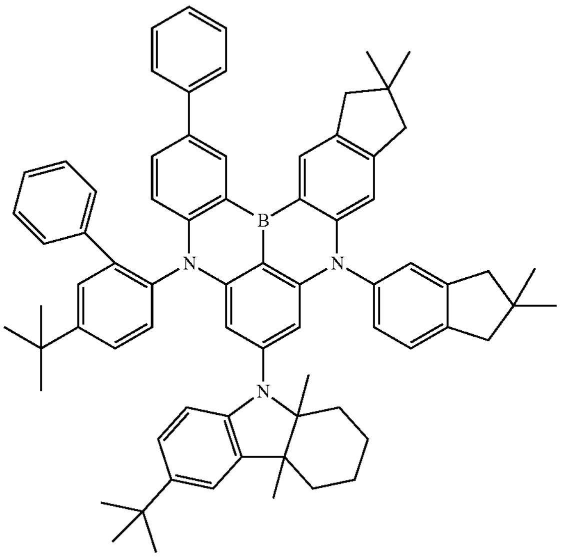
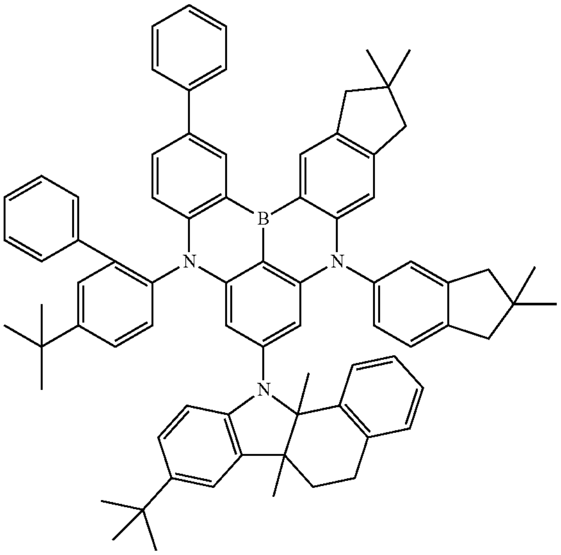
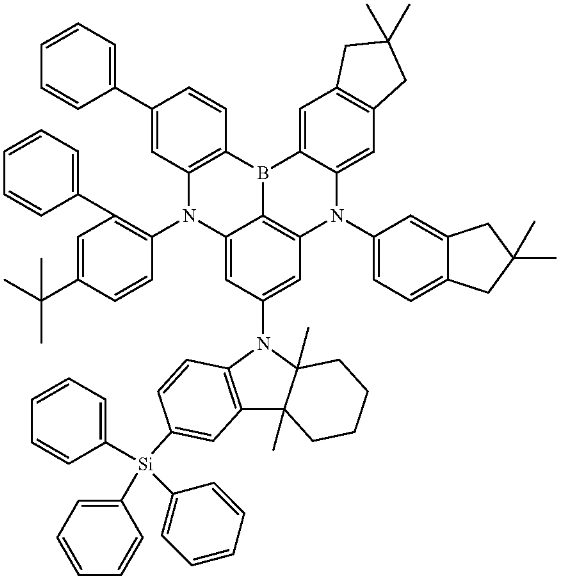
-continued
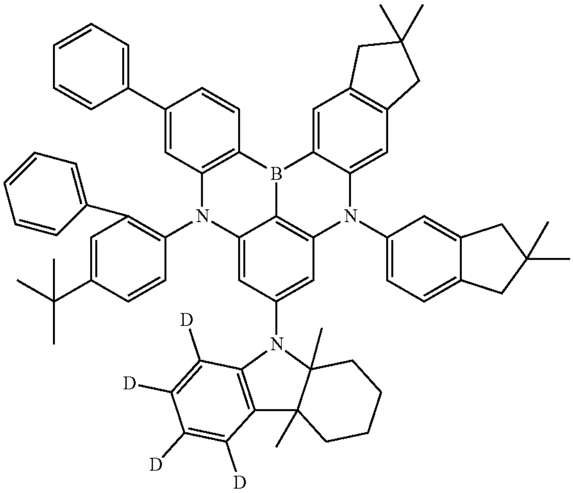
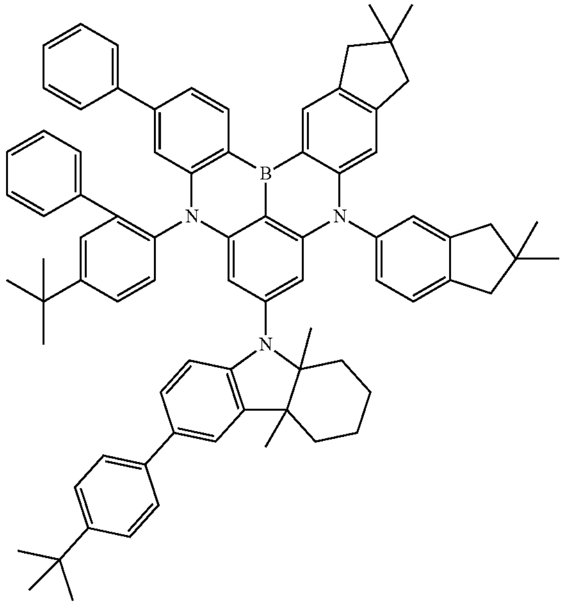
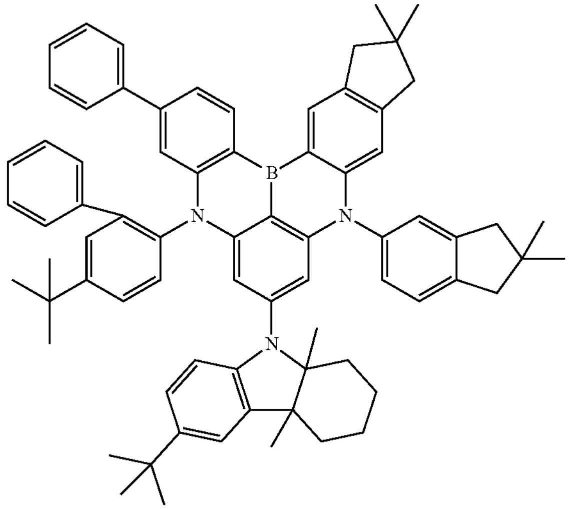

-continued
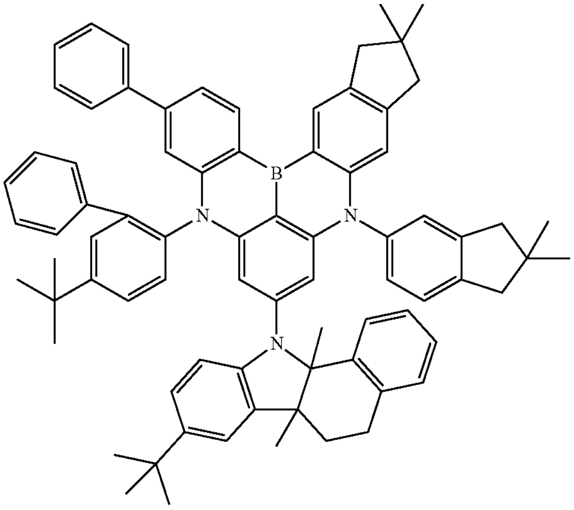
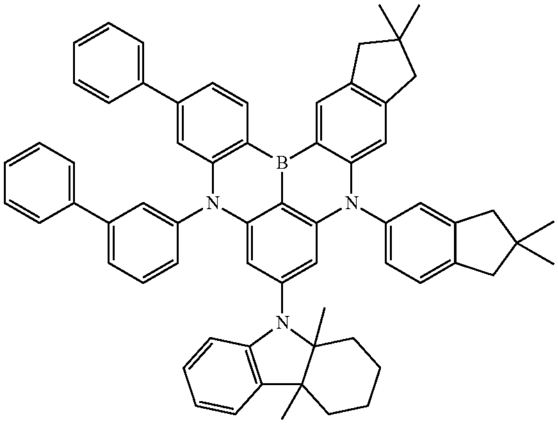
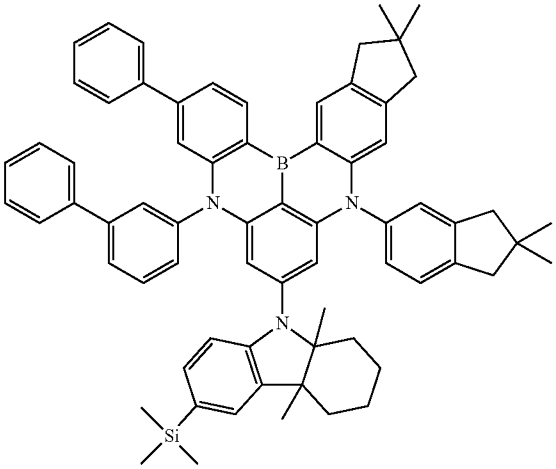
-continued
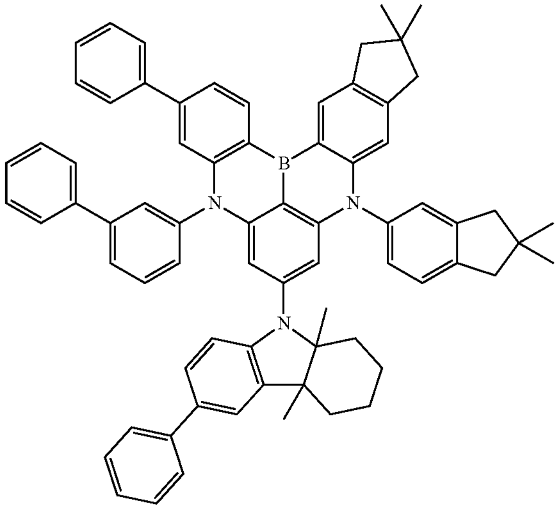
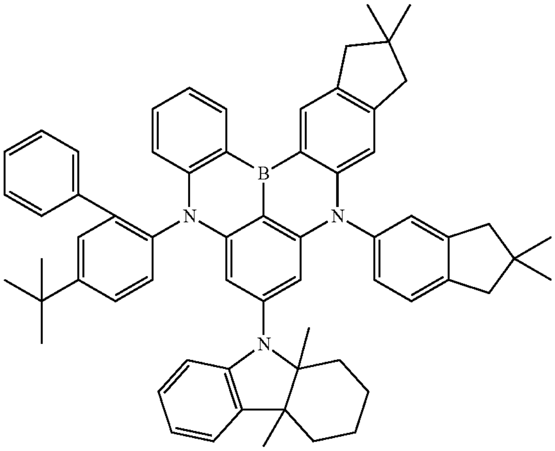
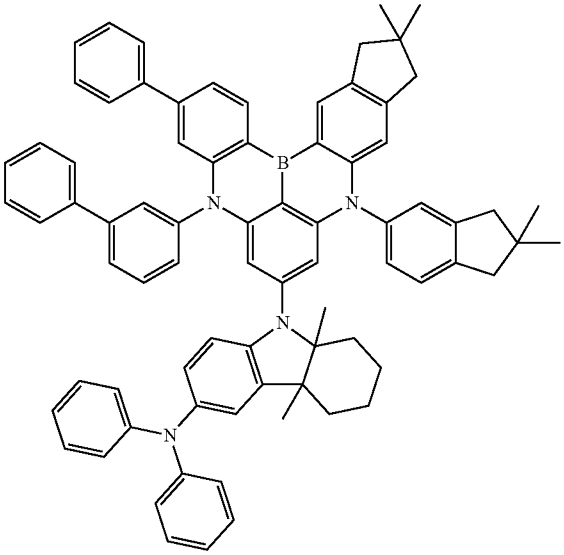

-continued
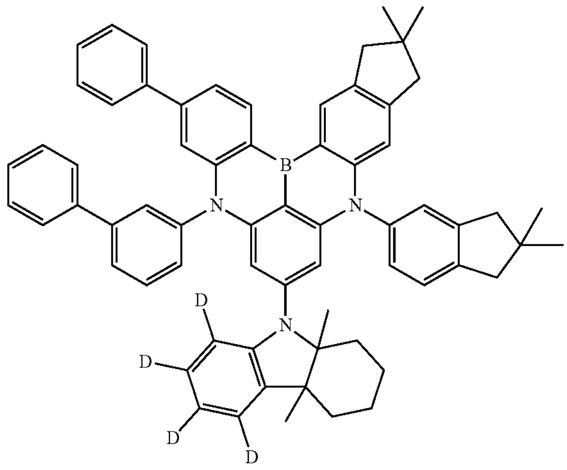
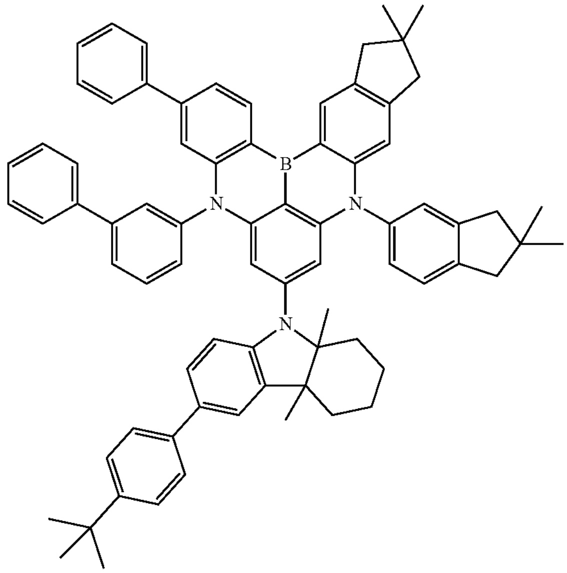
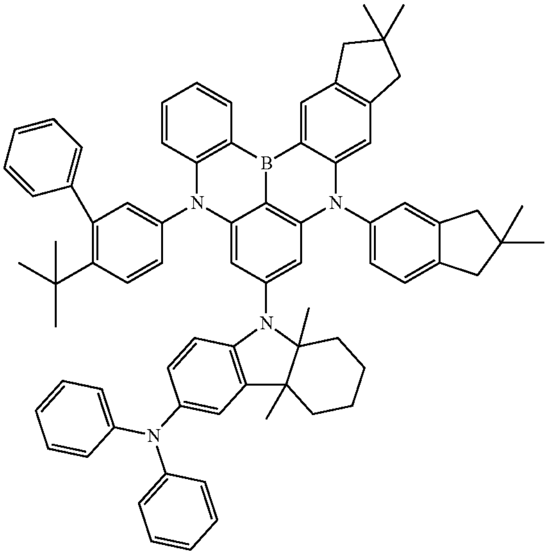
-continued
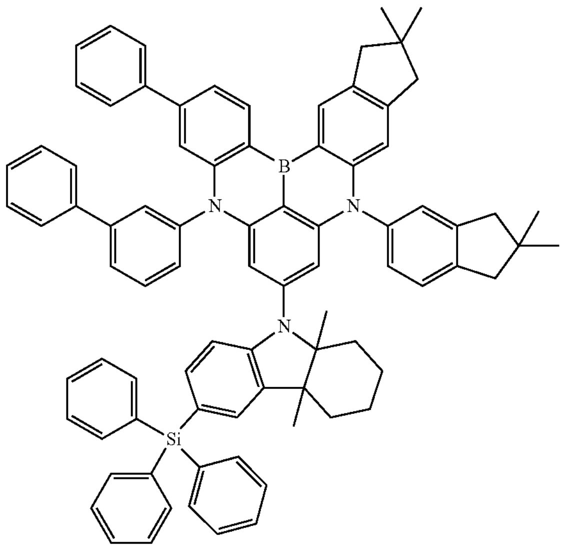
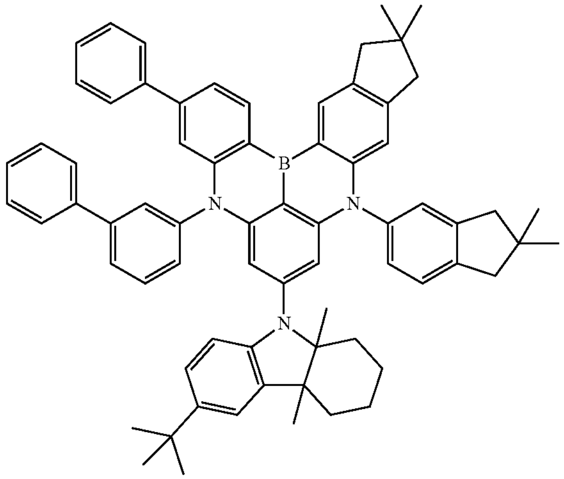
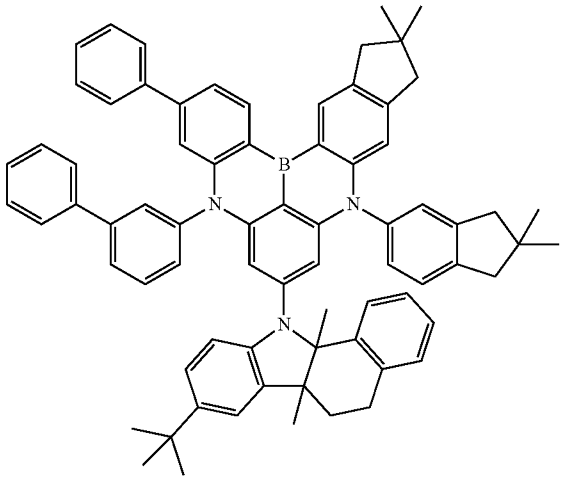

-continued
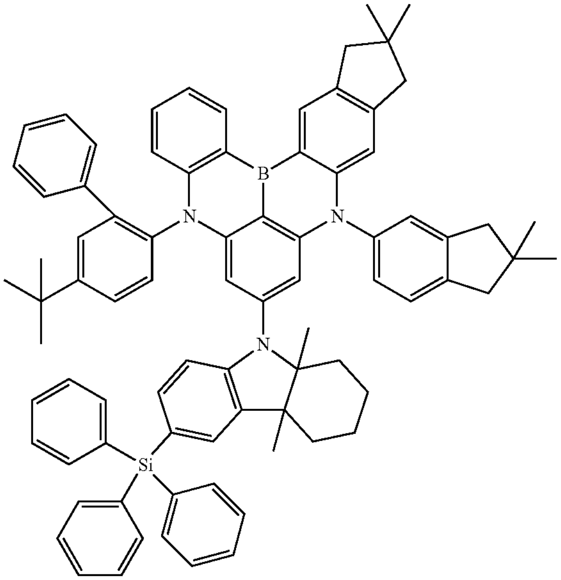
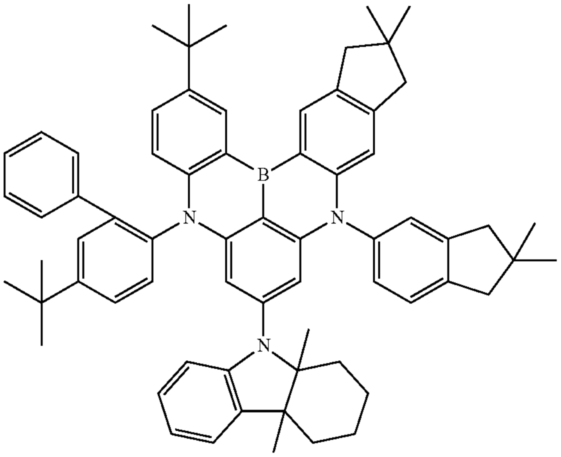
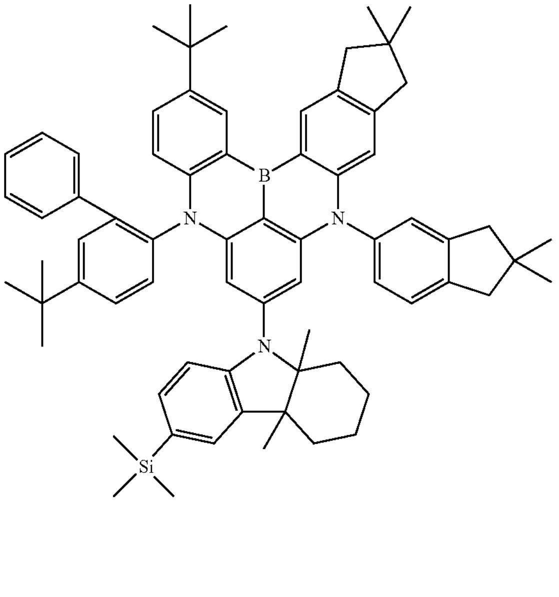
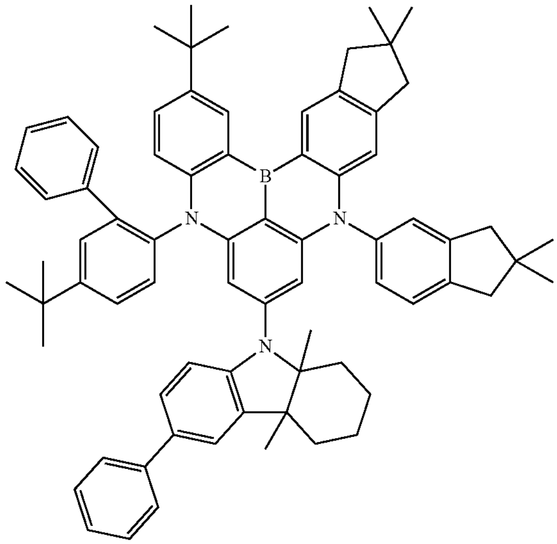
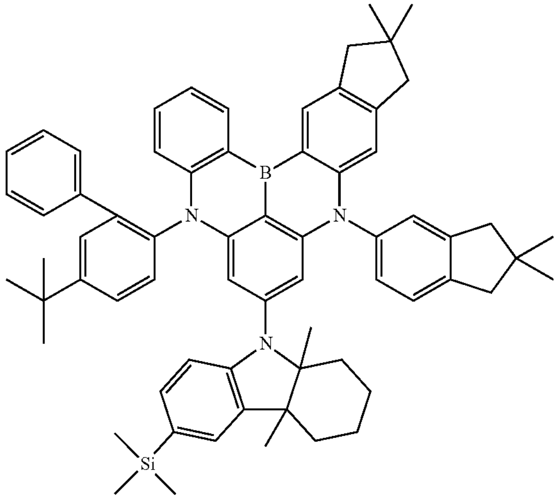
-continued
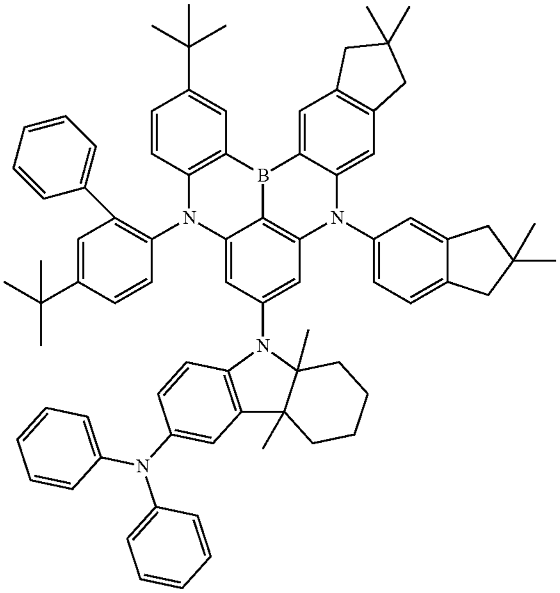

-continued
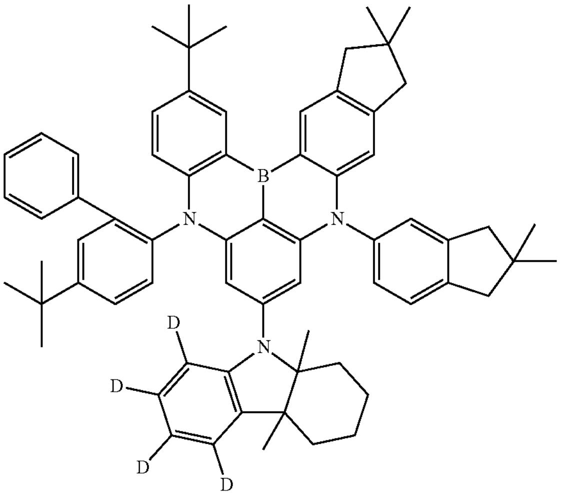
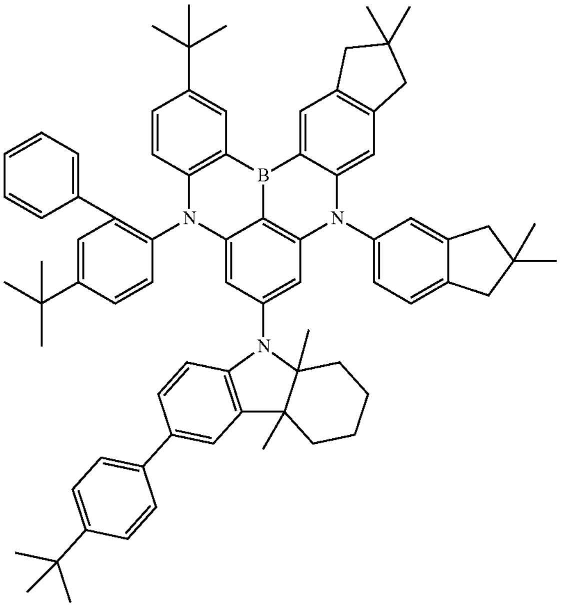
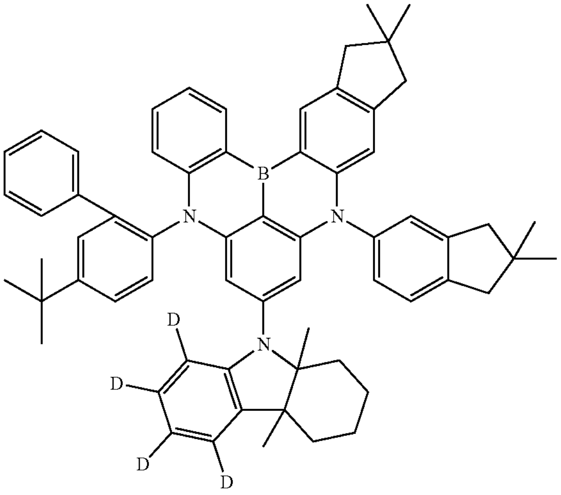
-continued
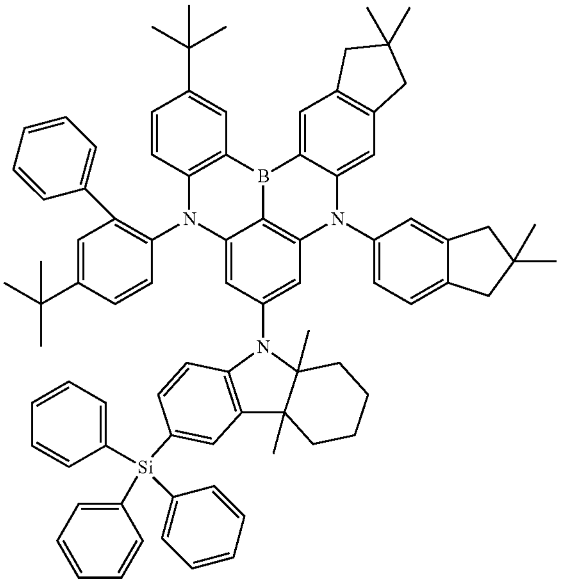
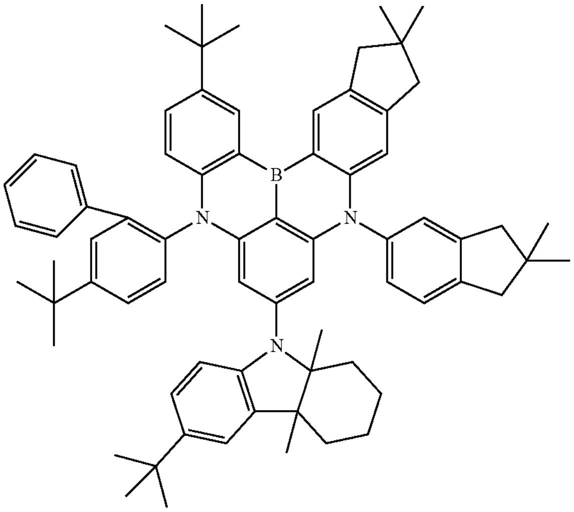
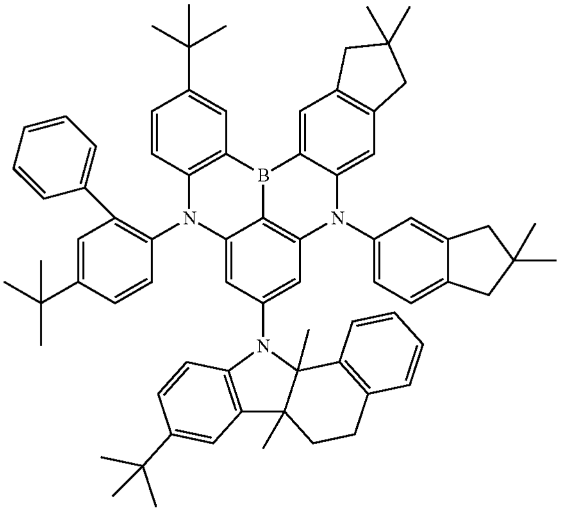

-continued
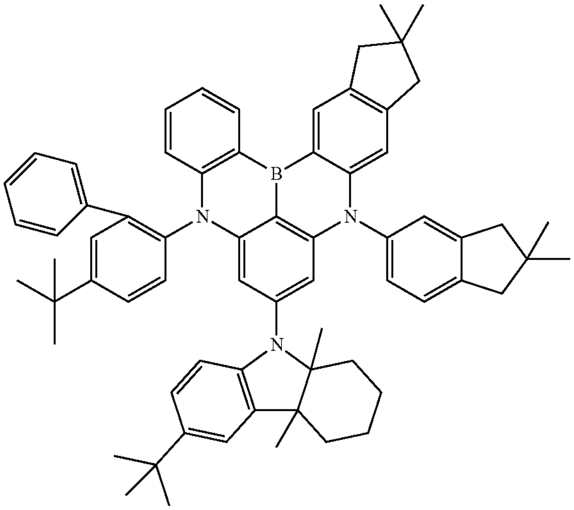
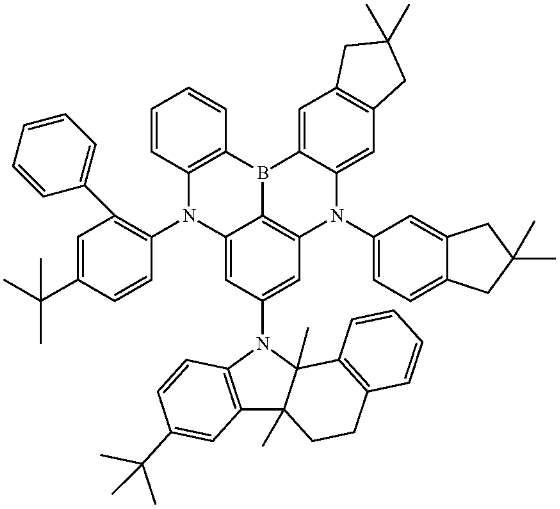
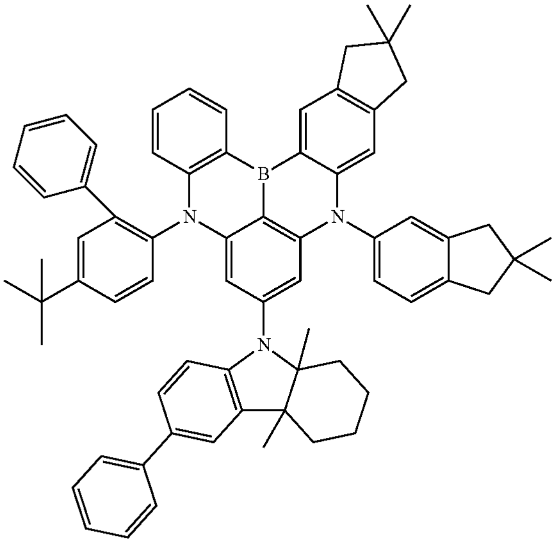
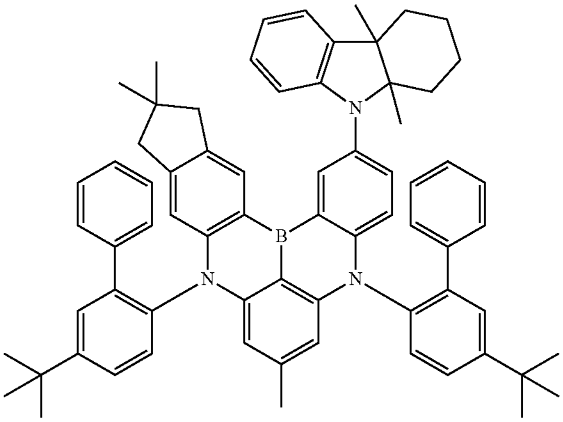
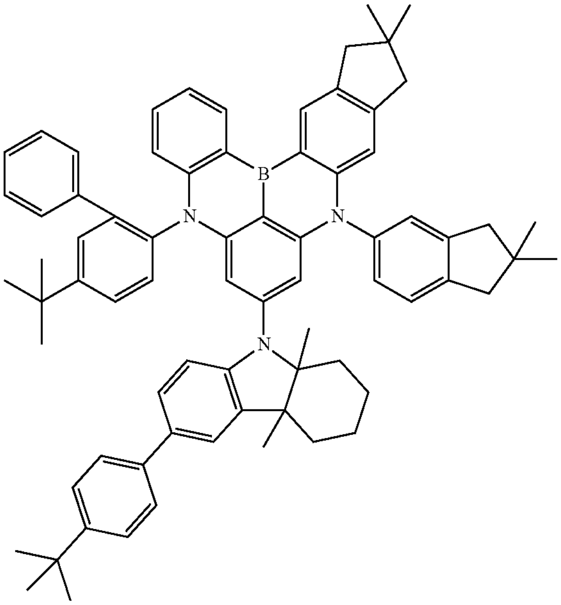
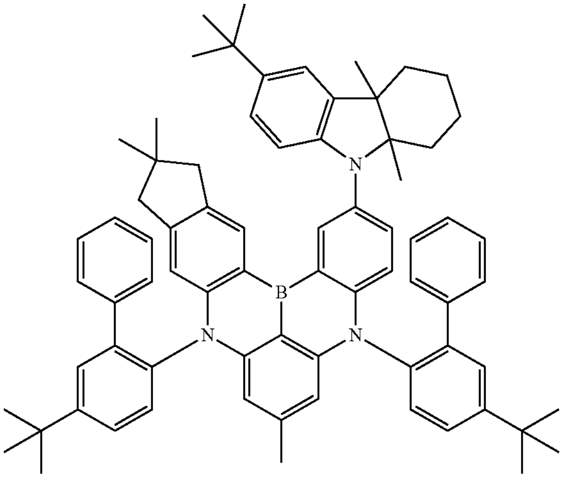
-continued -continued
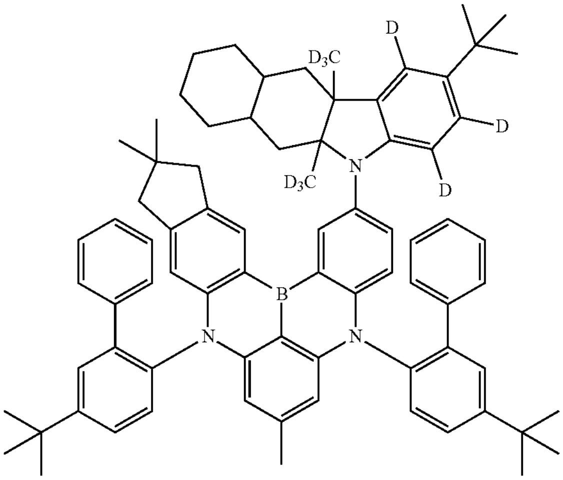
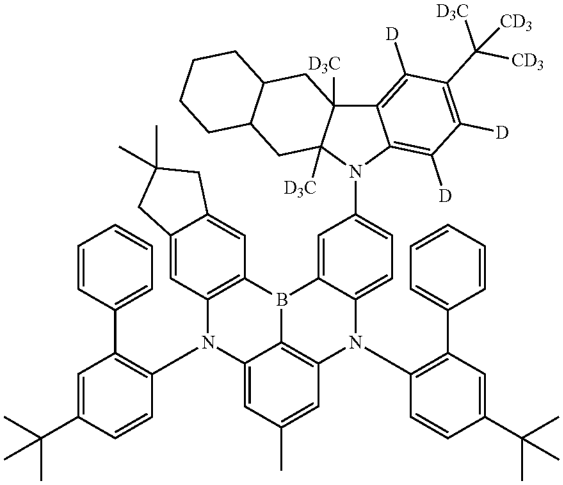
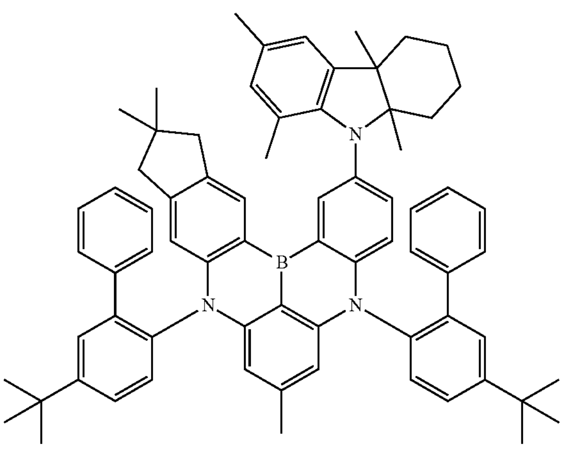
-continued
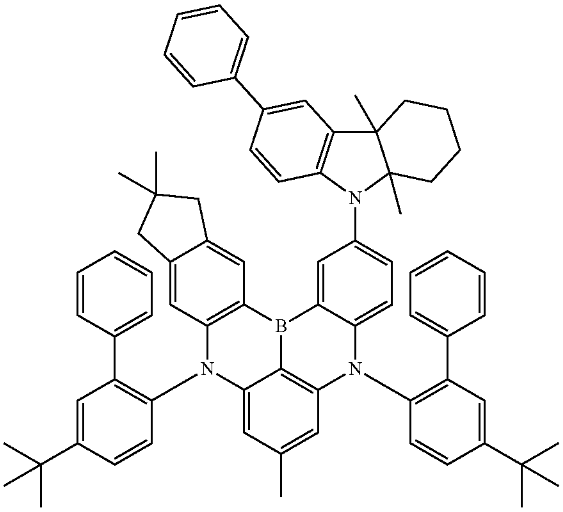
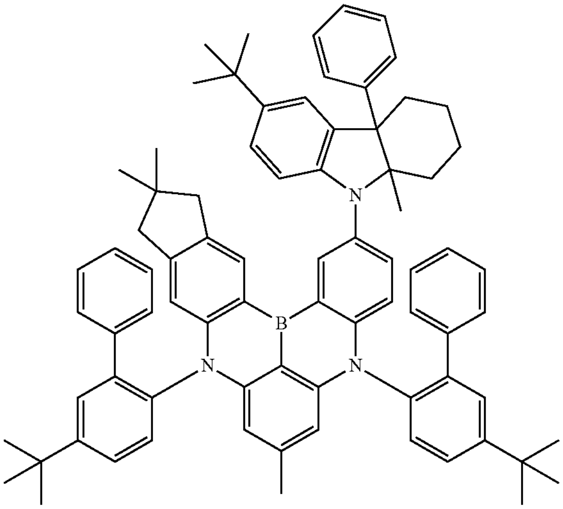
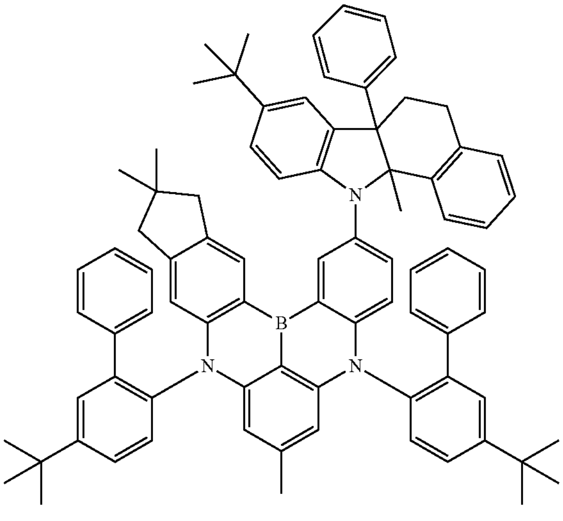

-continued
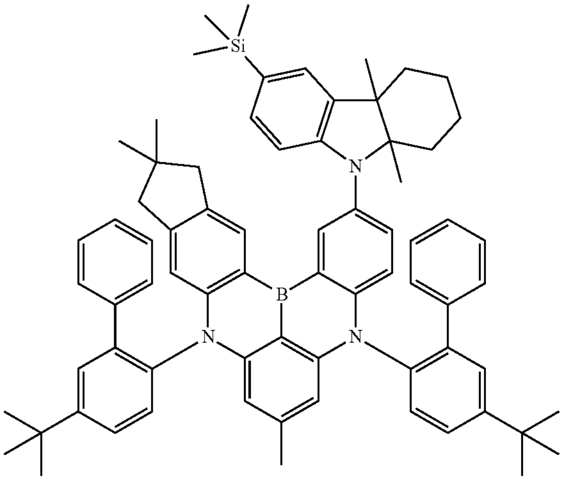
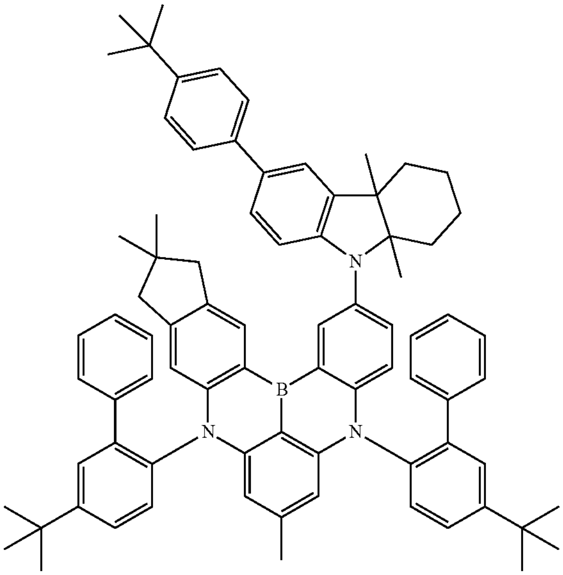
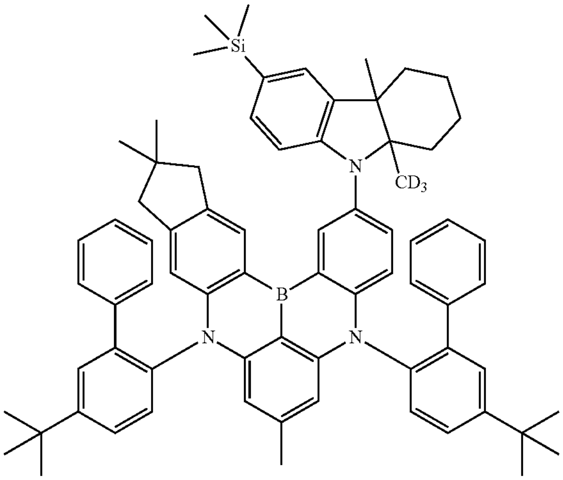
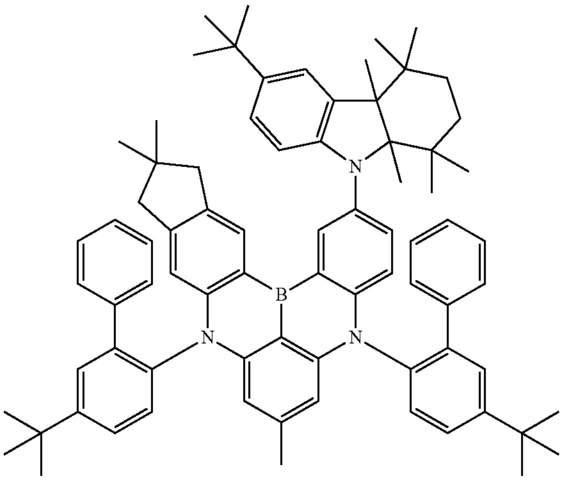
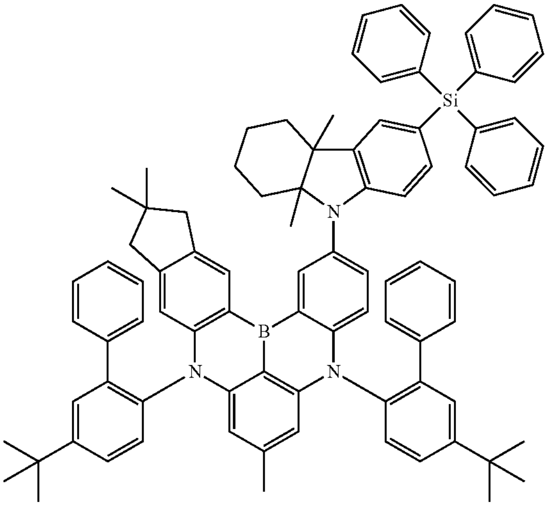
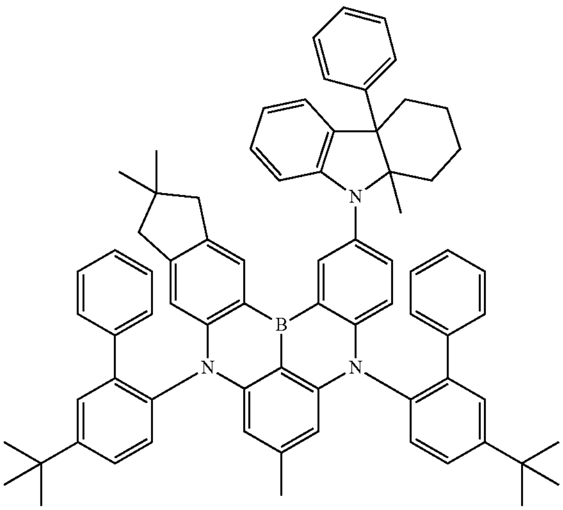
-continued -continued
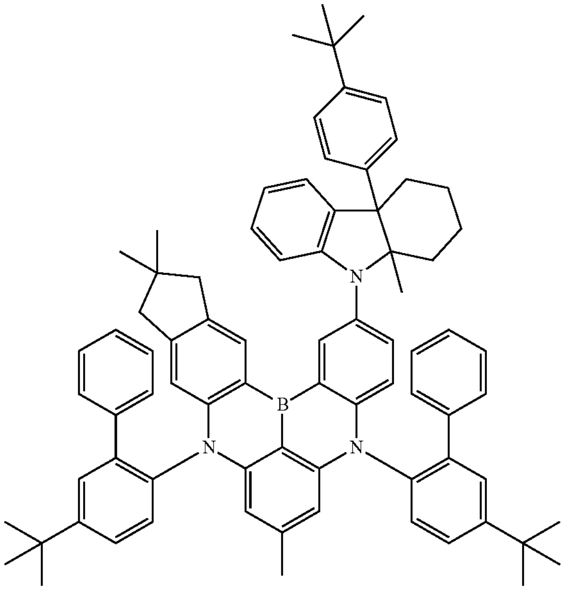
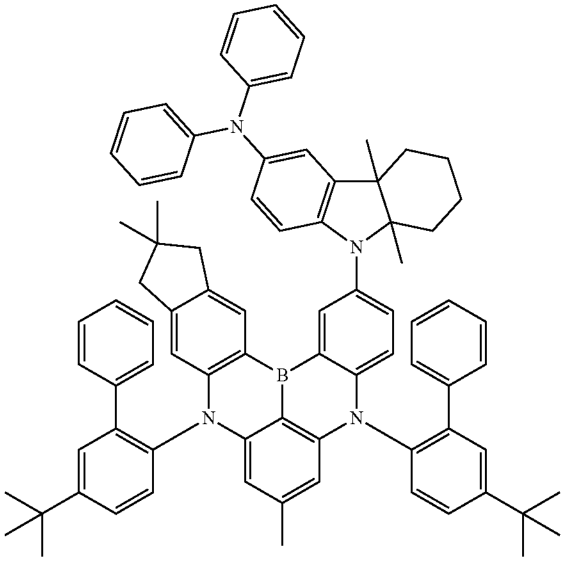
-continued
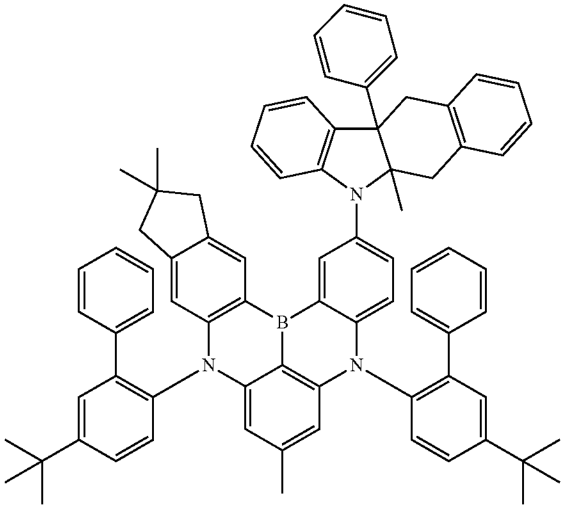
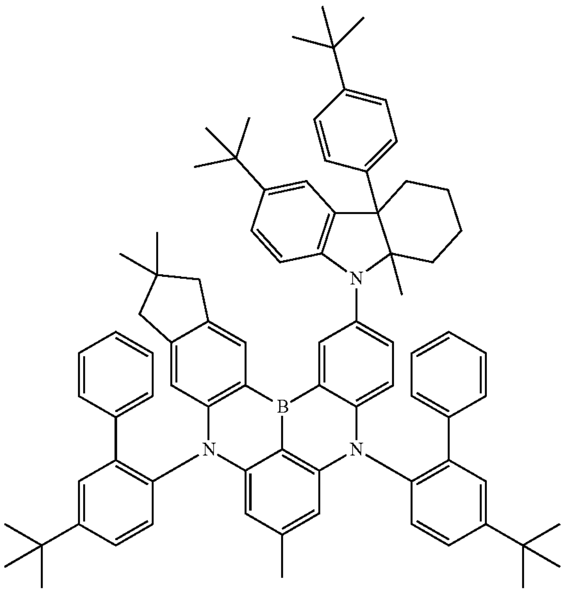
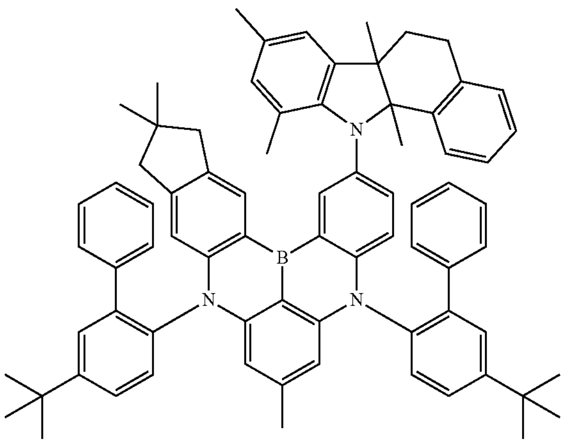

-continued
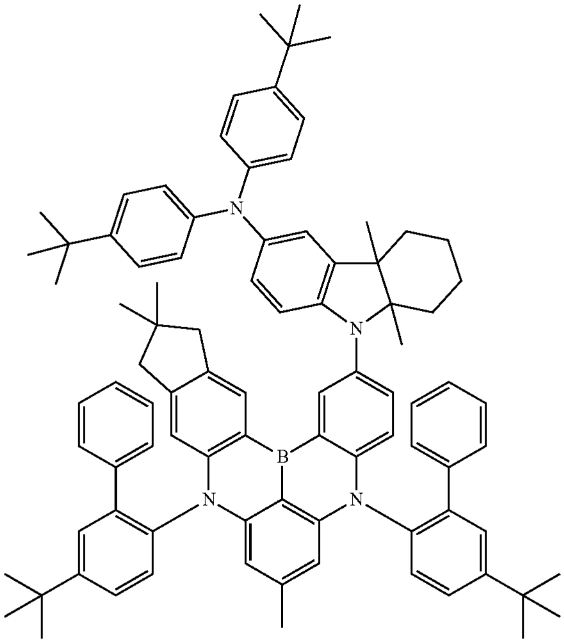
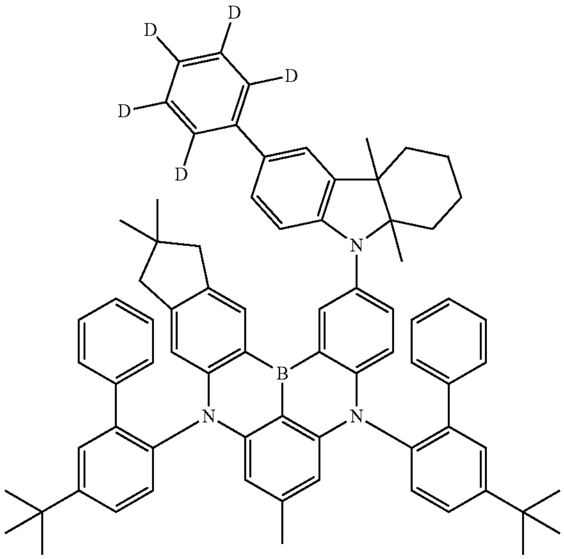
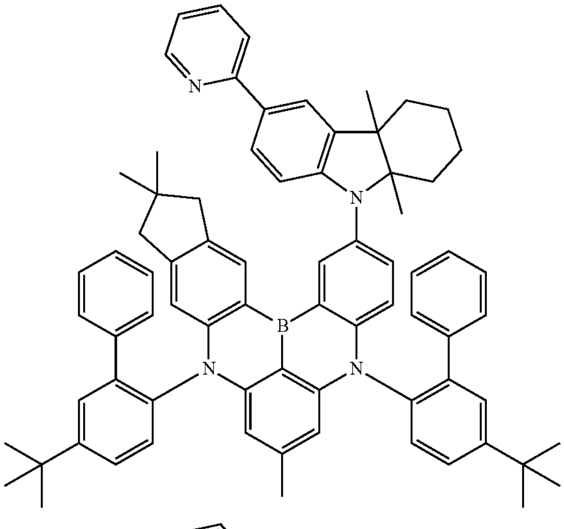
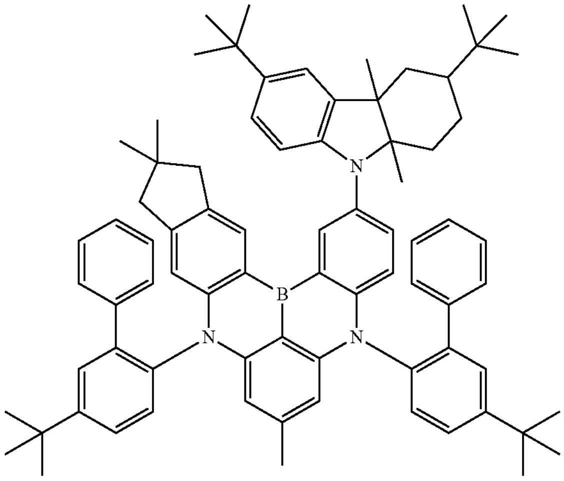
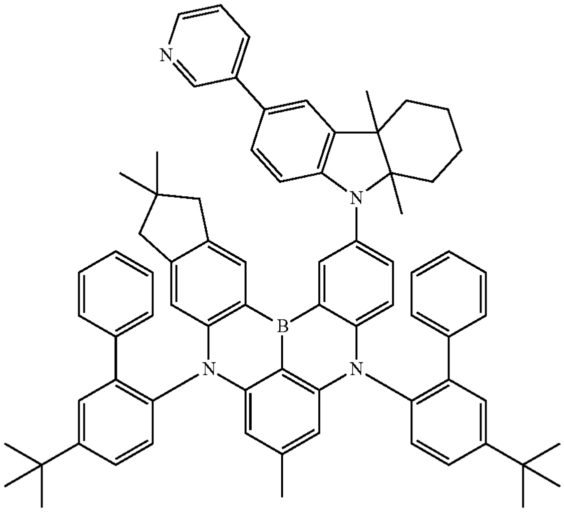
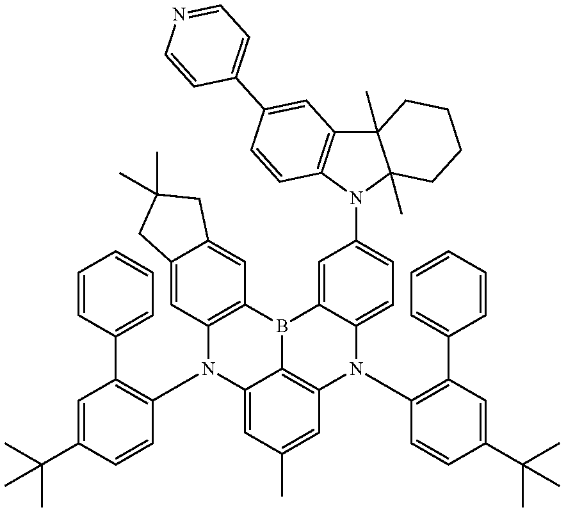
-continued -continued
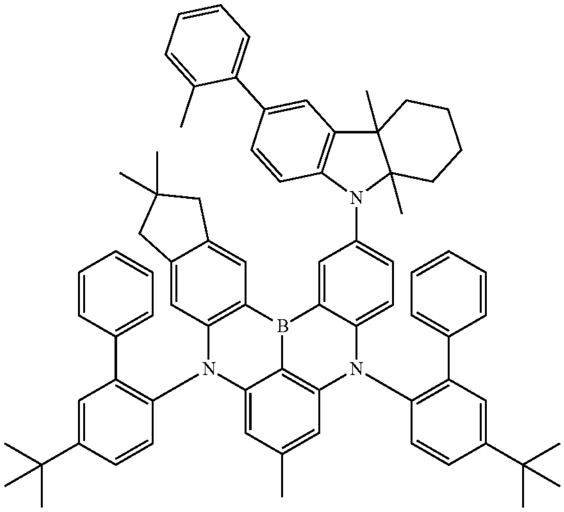
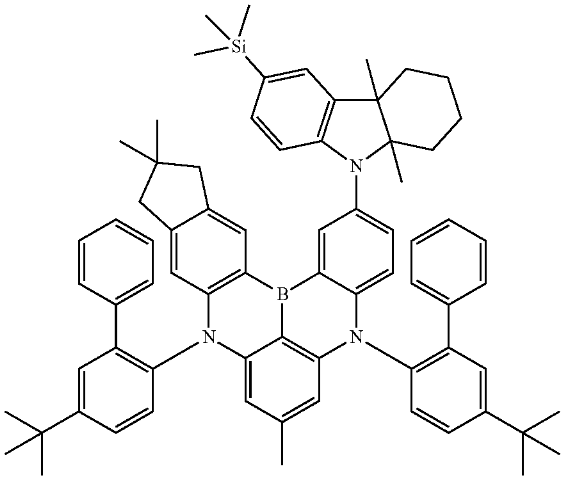
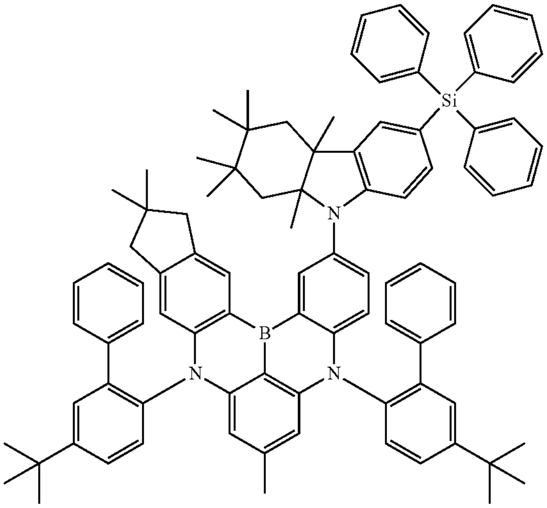
-continued
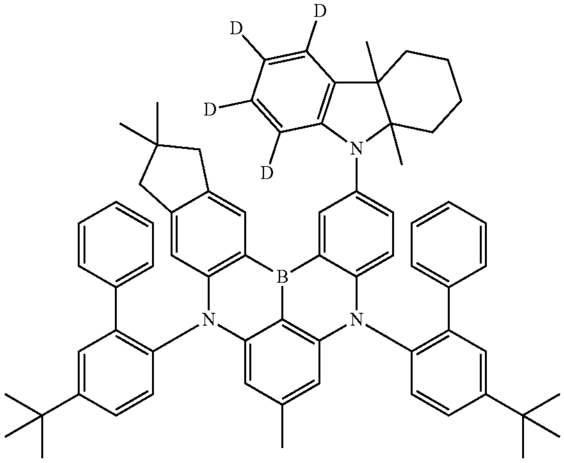
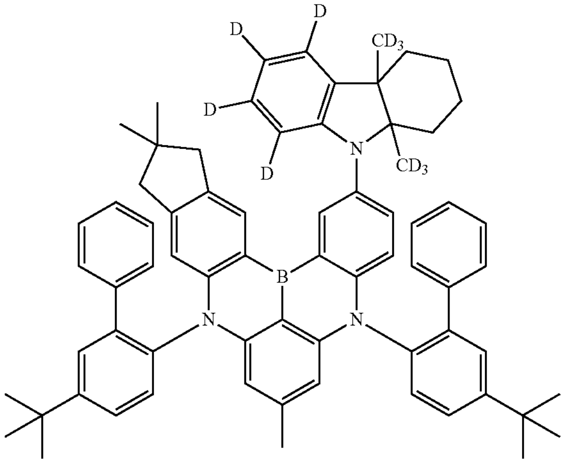
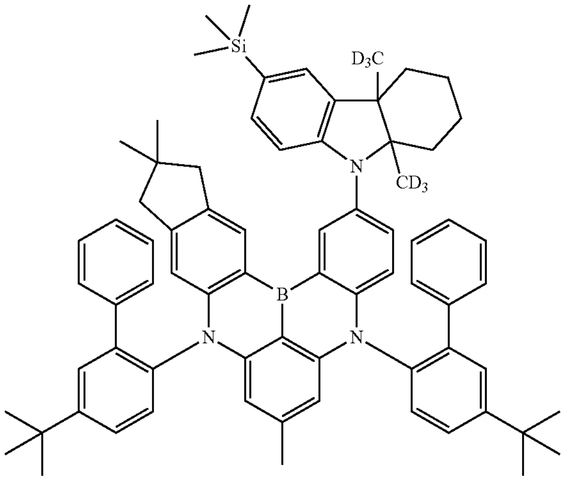

-continued
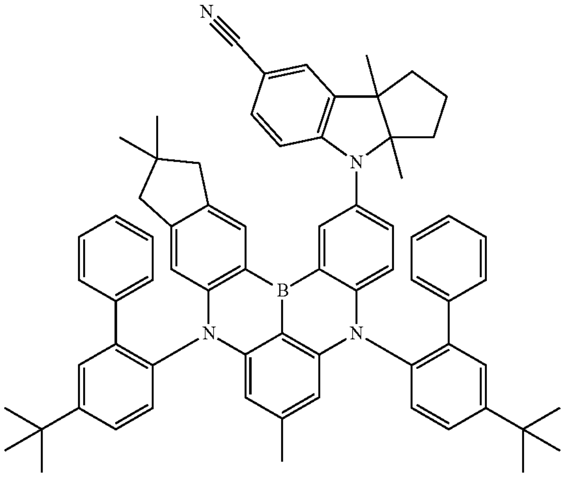
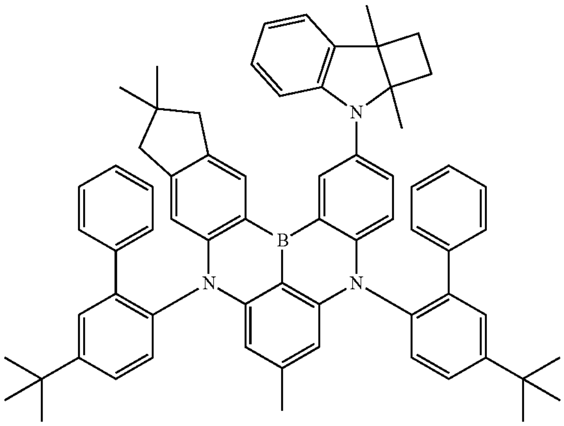
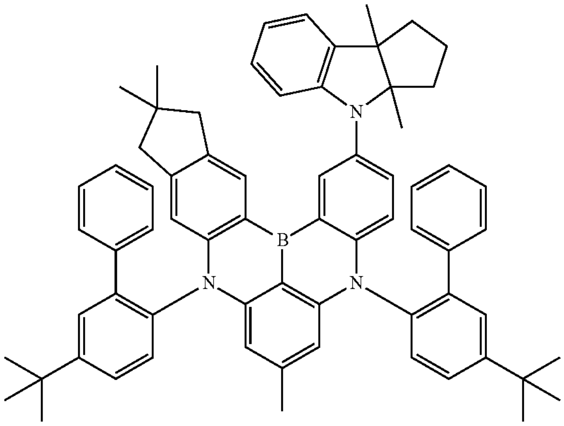
-continued
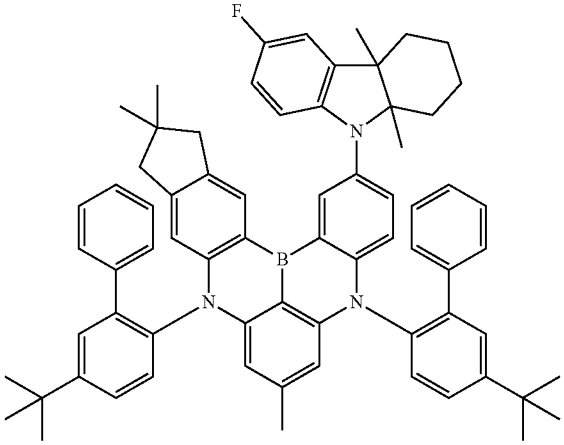
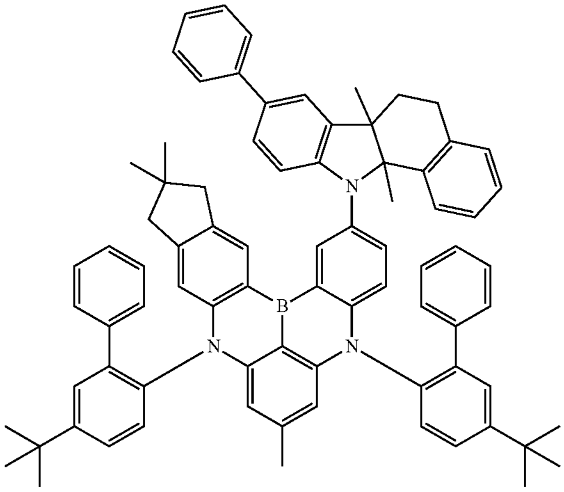
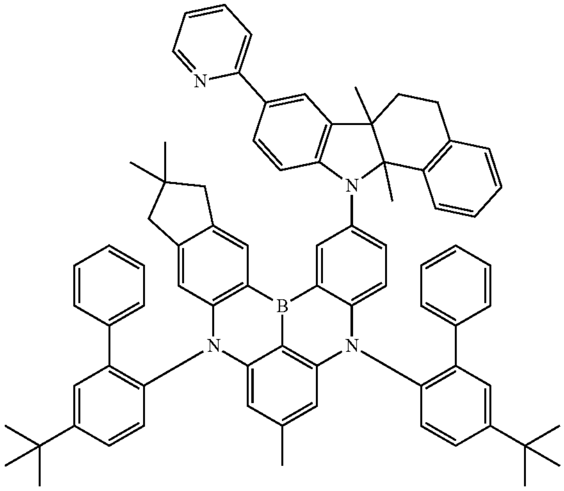

-continued
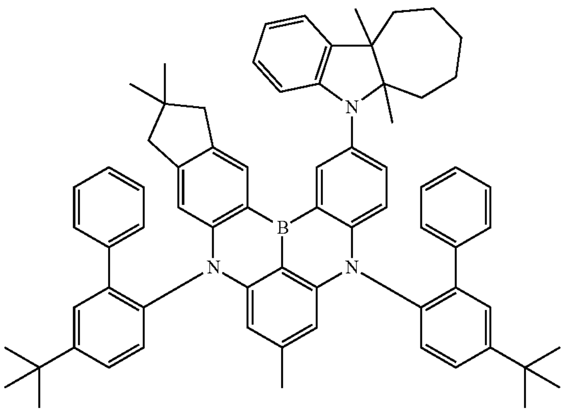
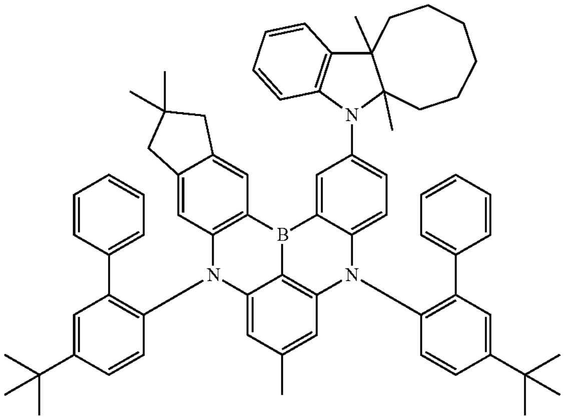
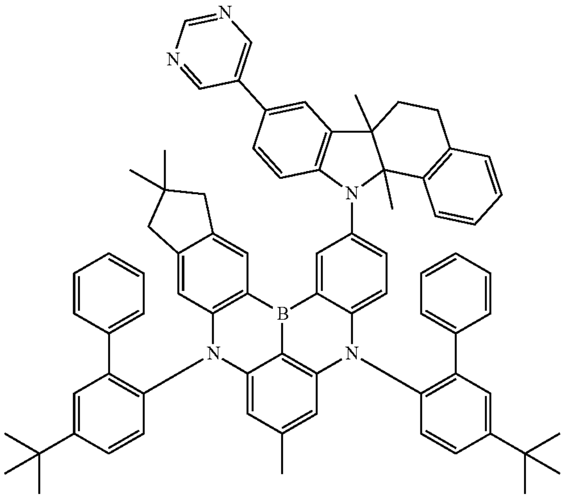
-continued
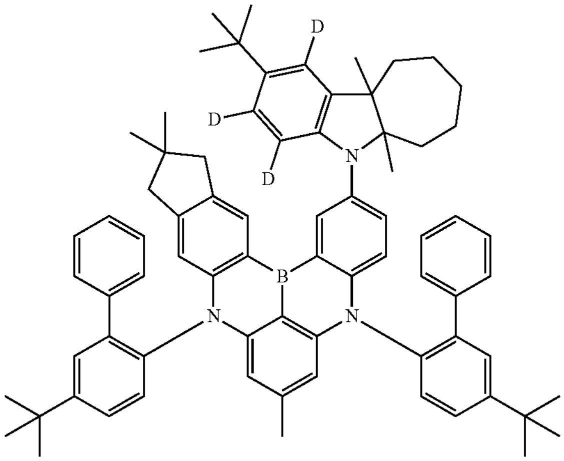
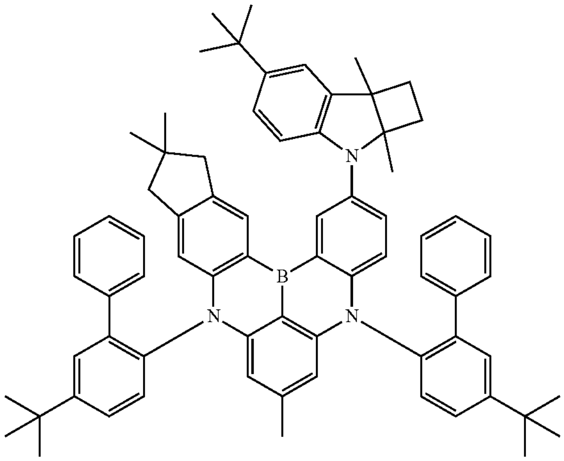
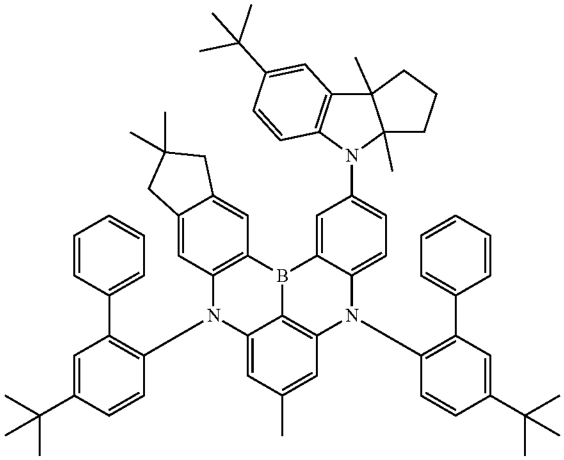

-continued
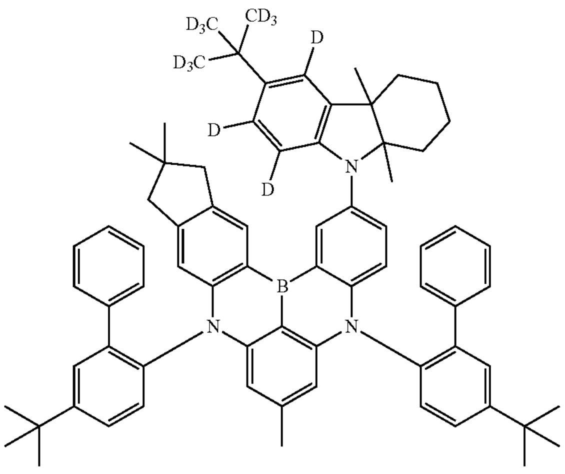
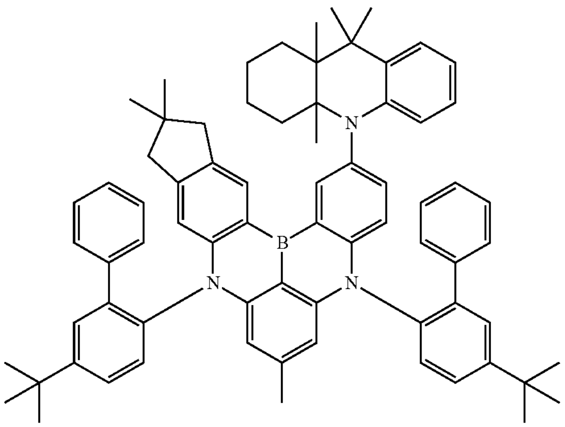
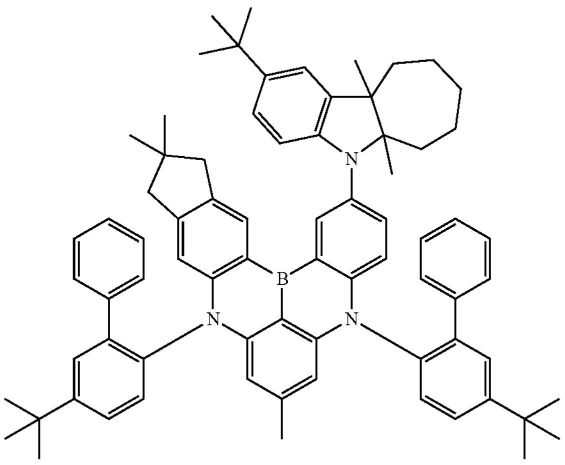
-continued
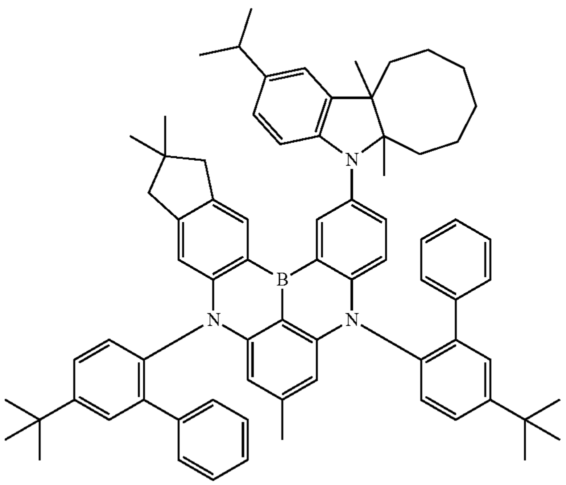
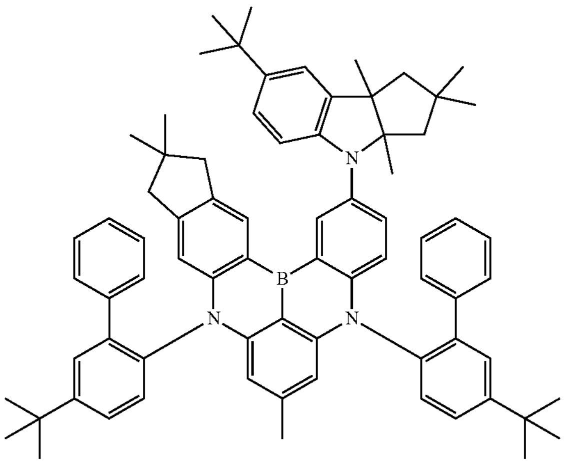
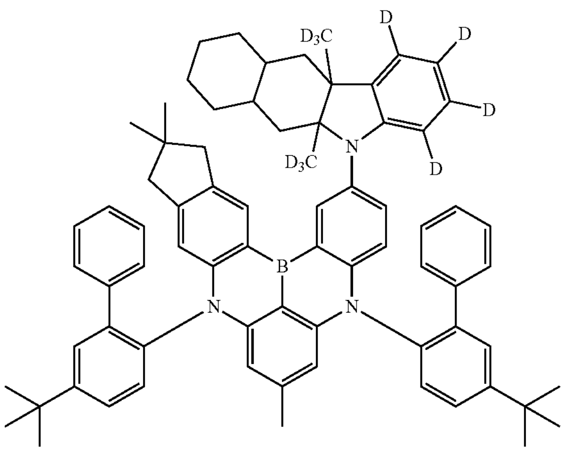

-continued
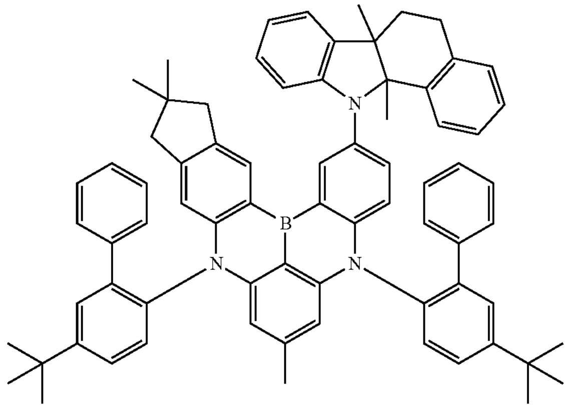
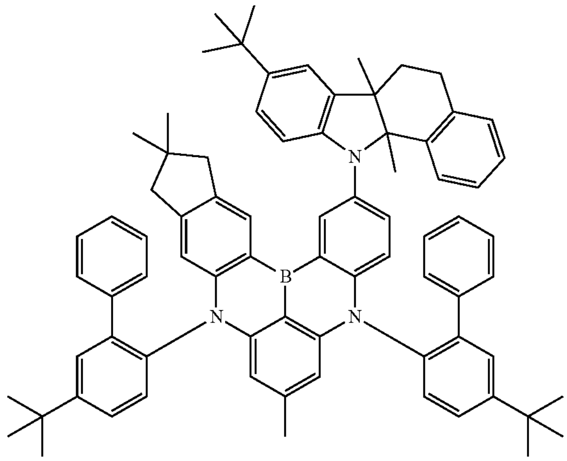
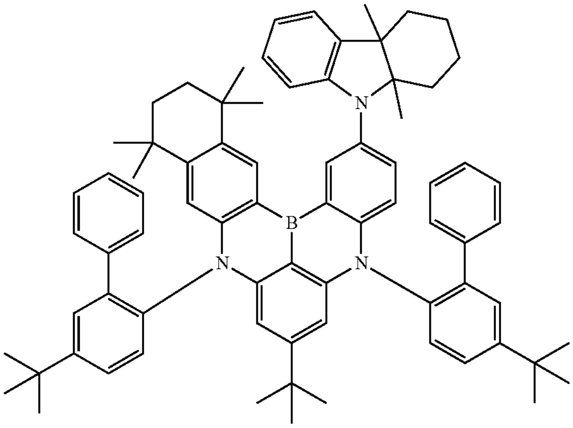
-continued
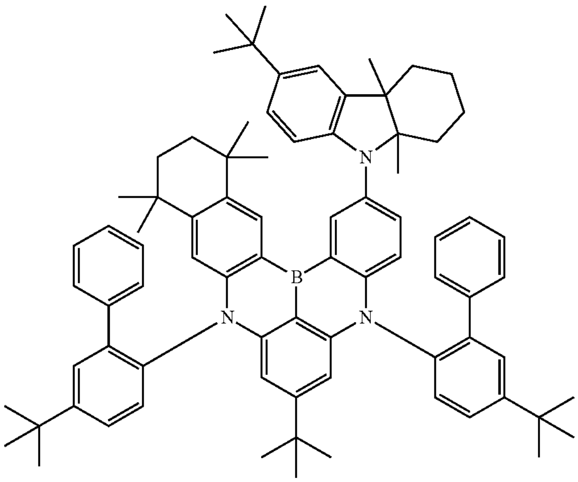
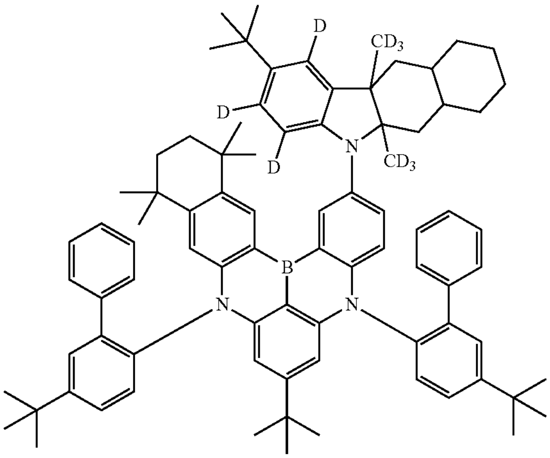
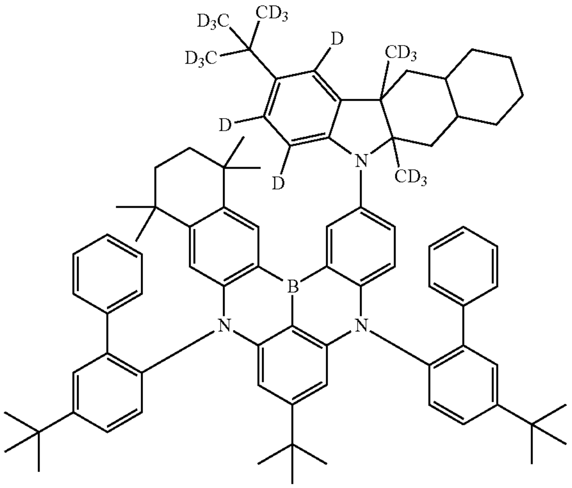

-continued
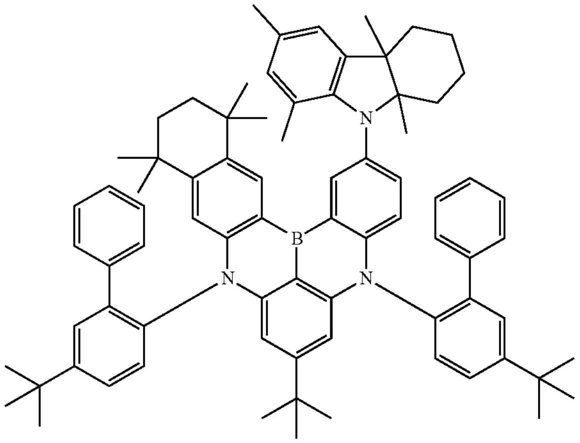
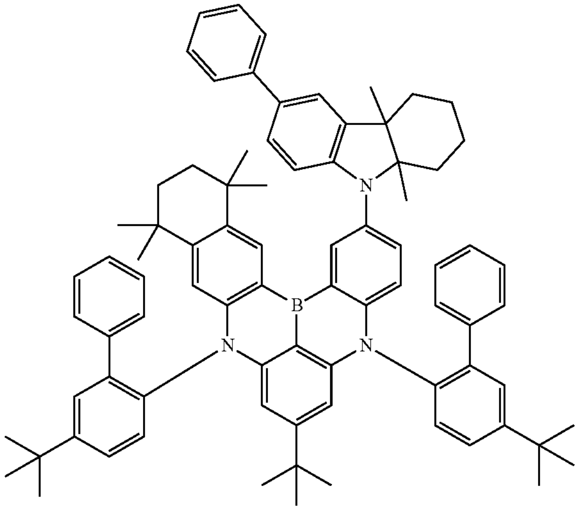
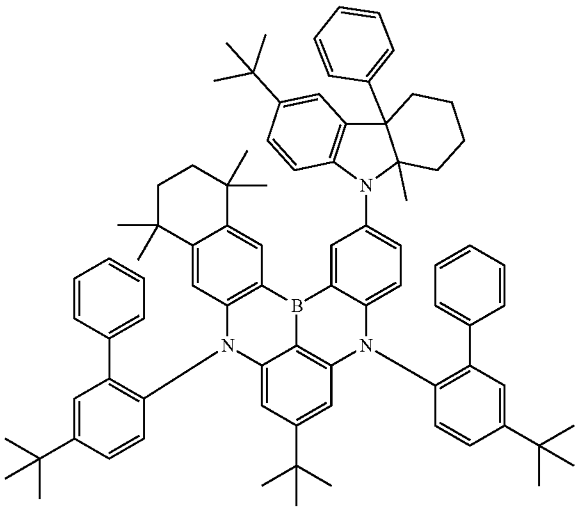
-continued
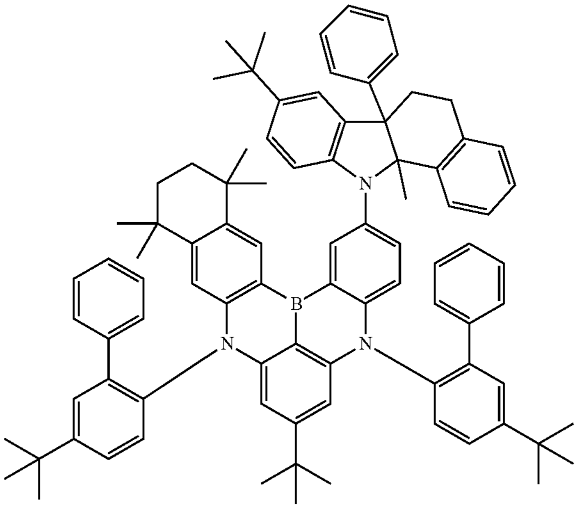
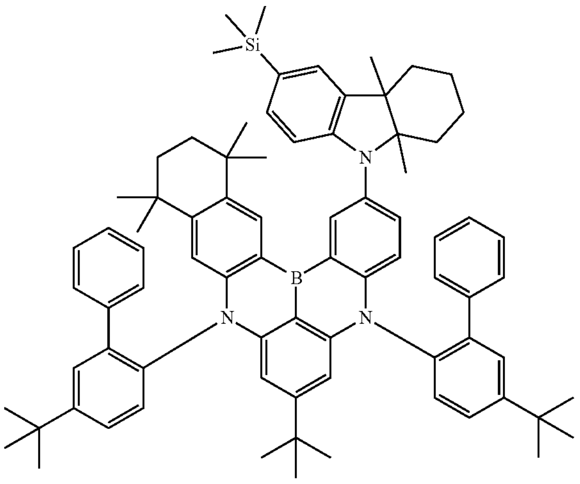
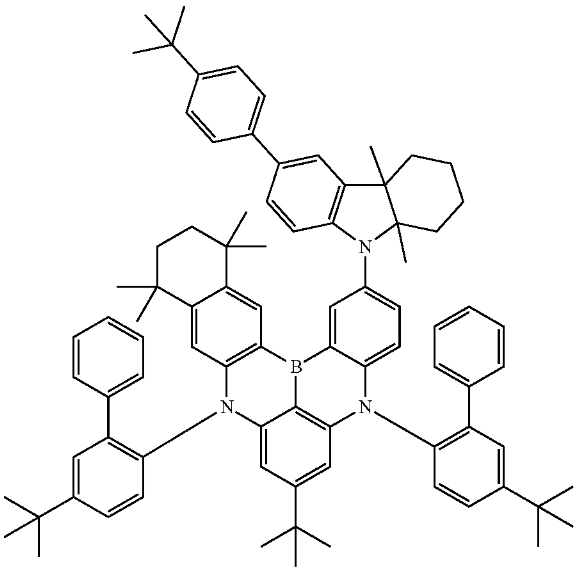

-continued
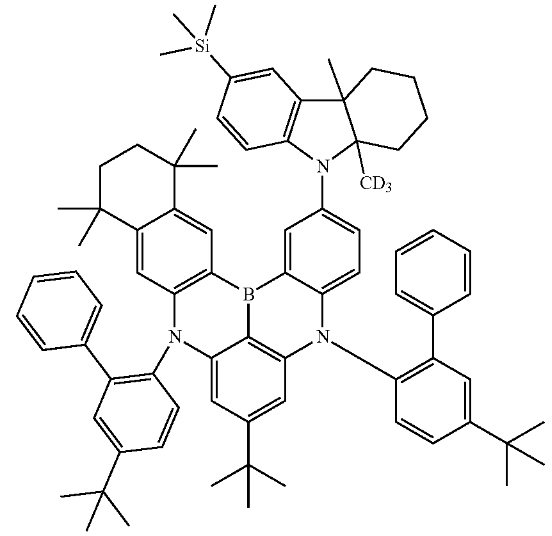
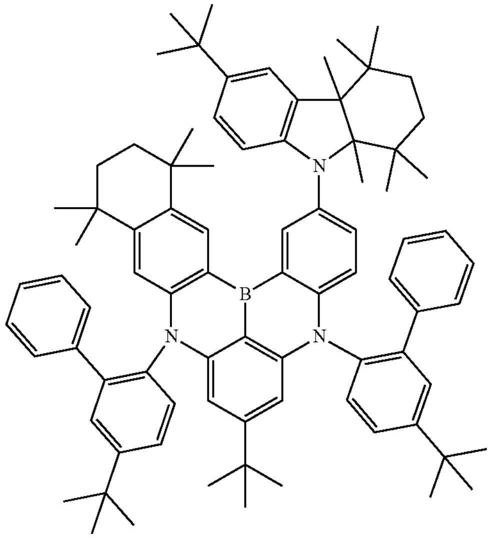 [SMILES: CC(C)(C)c1ccc(N2c3ccc(N4c5ccc(C(C)(C)C)cc5C5(C)C(C)(C)CCC(C)(C)C45C)cc3B3c4cc5c(cc4N(c4ccc(C(C)(C)C)cc4-c4ccccc4)c4cc(C(C)(C)C)cc2c43)C(C)(C)CCC5(C)C)c(-c2ccccc2)c1]
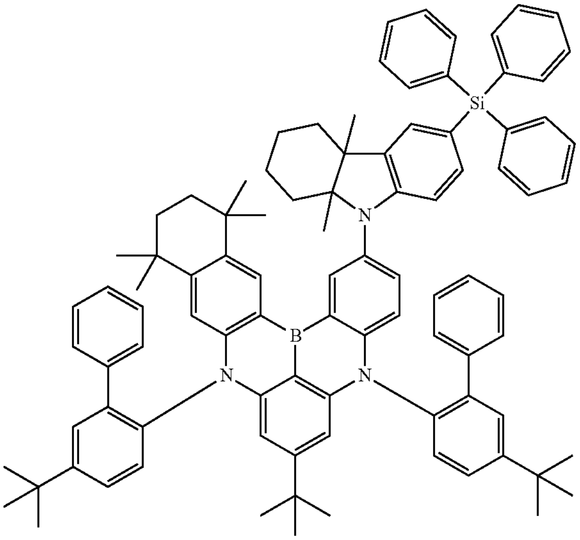
-continued
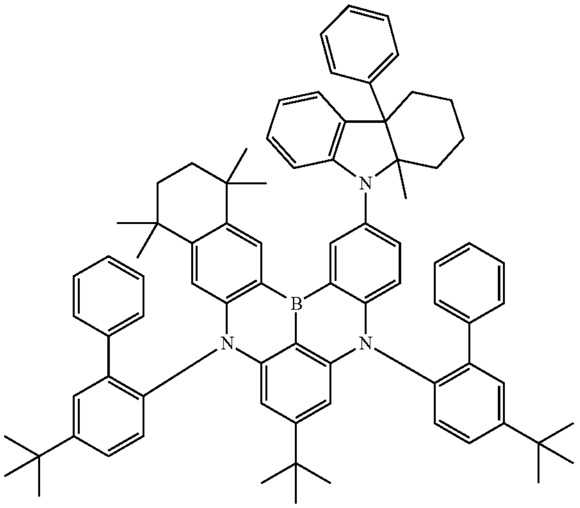
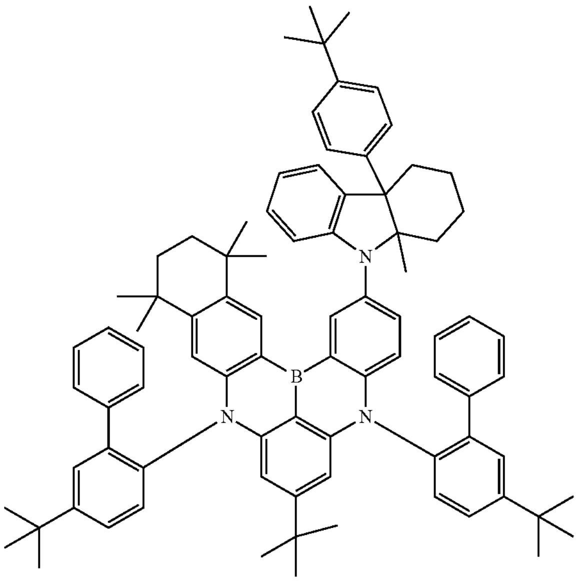
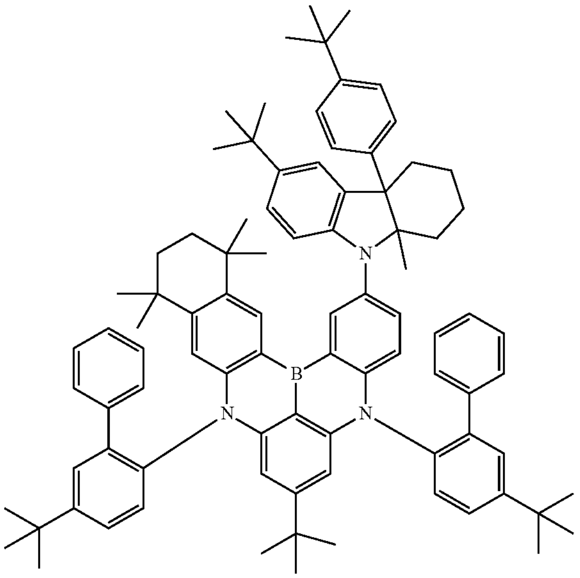 [SMILES: CC(C)(C)c1ccc(C23CCCCC2(C)N(c2ccc4c(c2)B2c5cc6c(cc5N(c5ccc(C(C)(C)C)cc5-c5ccccc5)c5cc(C(C)(C)C)cc(c52)N4c2ccc(C(C)(C)C)cc2-c2ccccc2)C(C)(C)CCC6(C)C)c2ccc(C(C)(C)C)cc23)cc1]

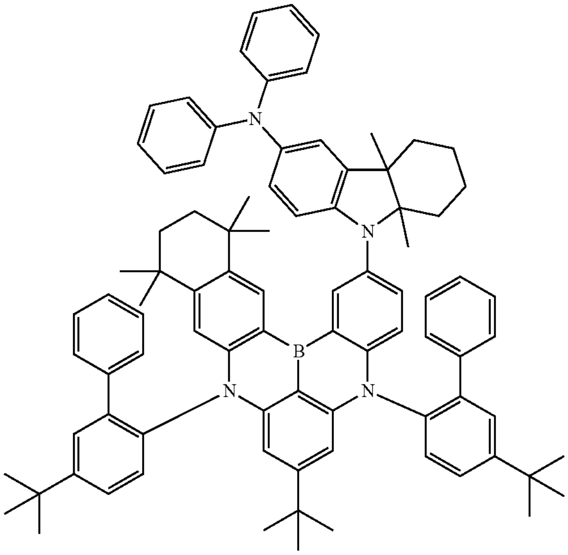
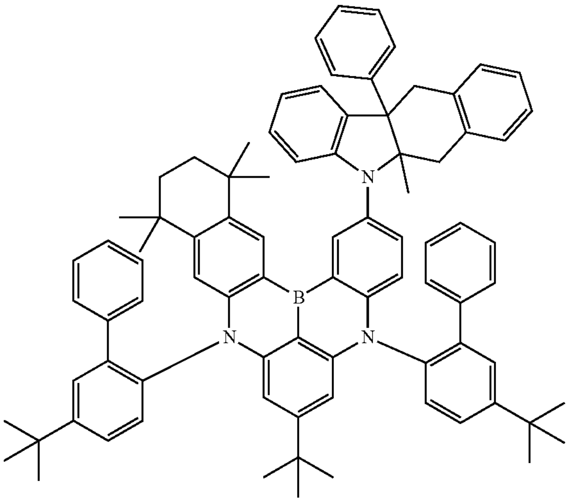
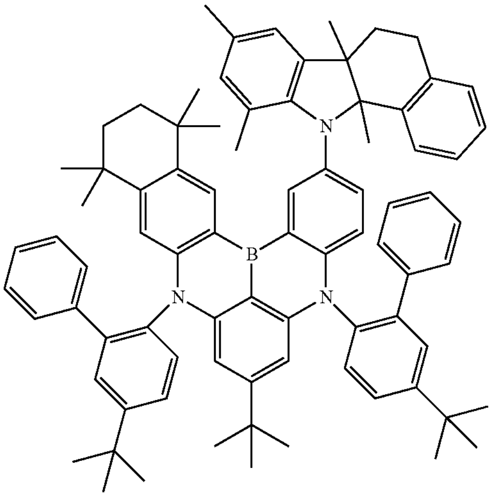
-continued
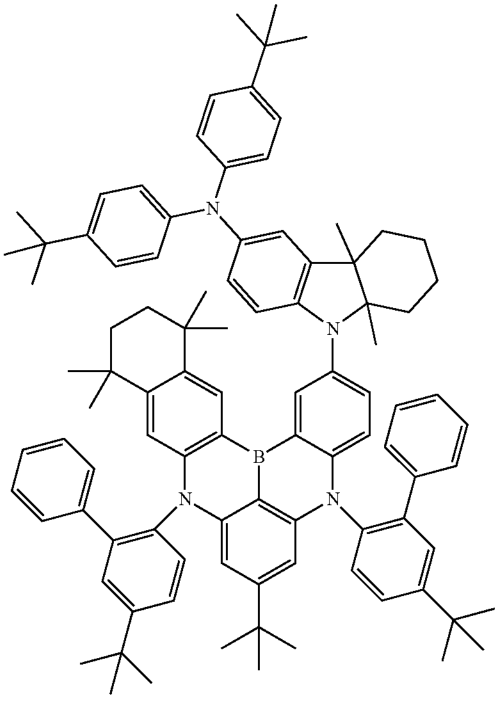
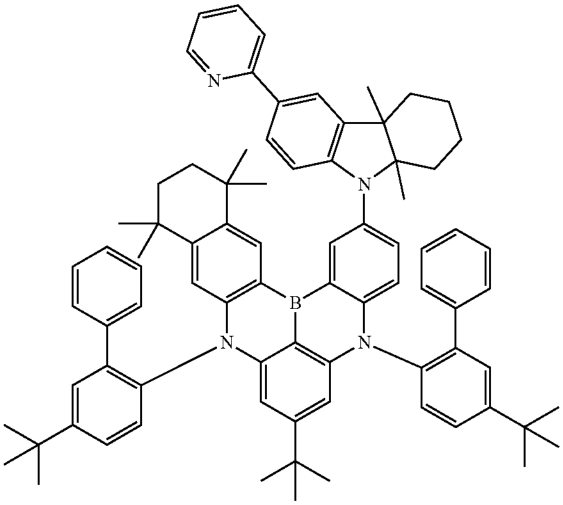
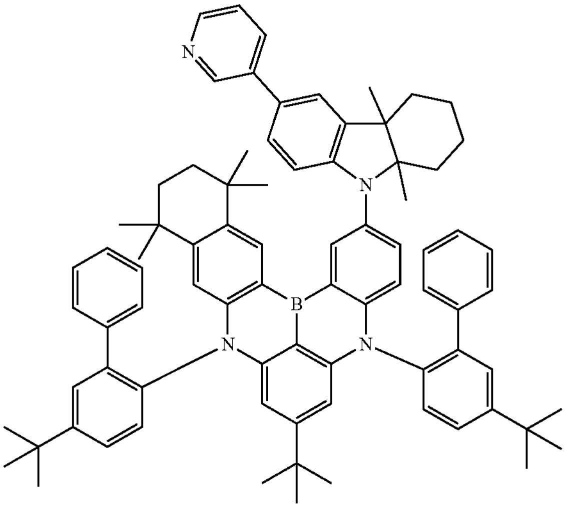

-continued
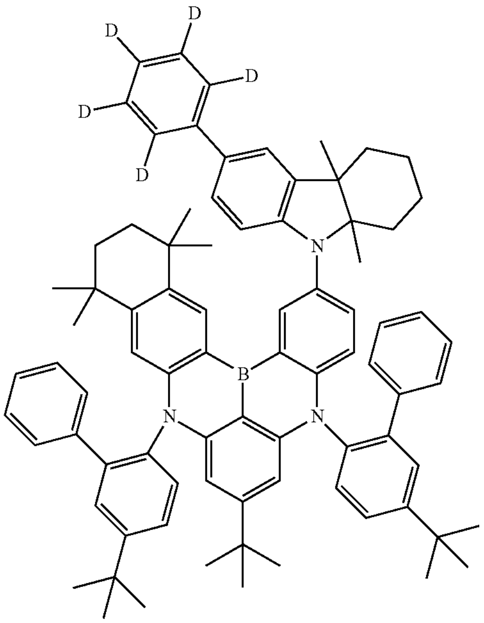
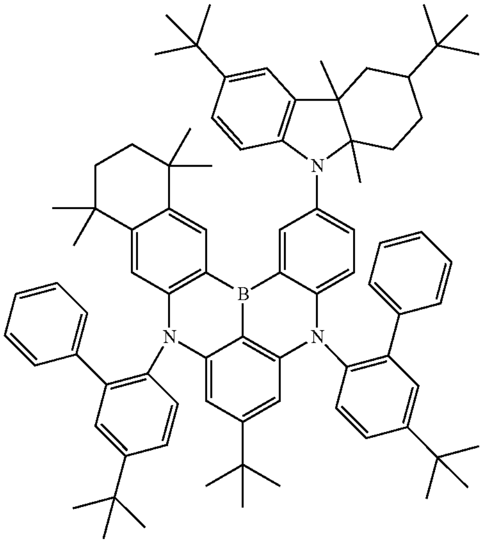
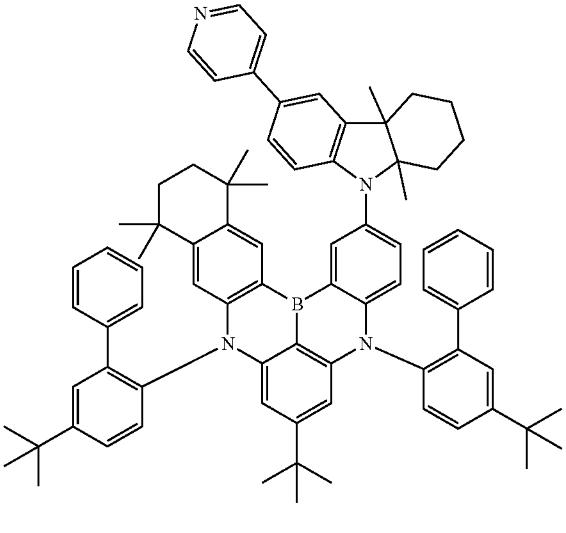
-continued
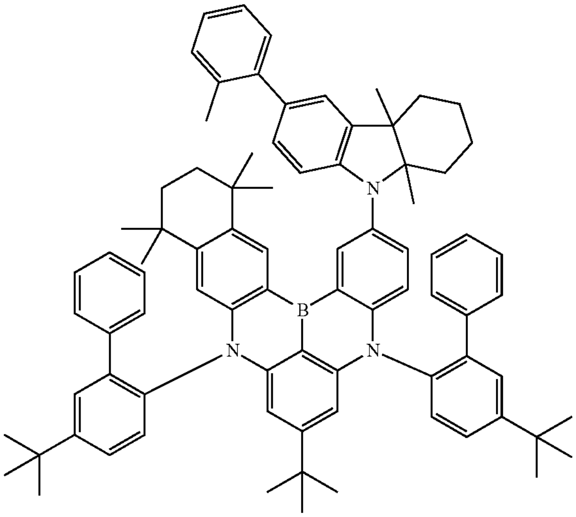
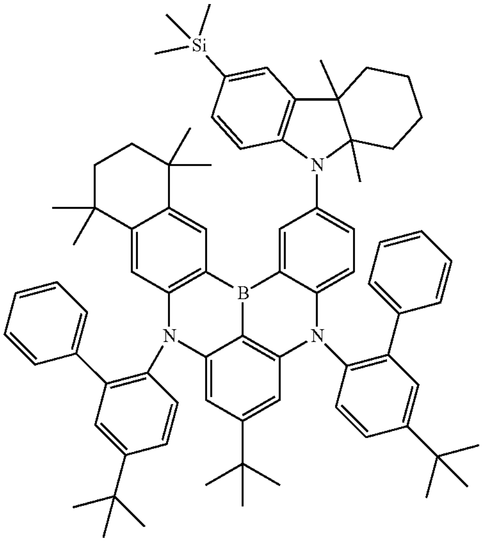
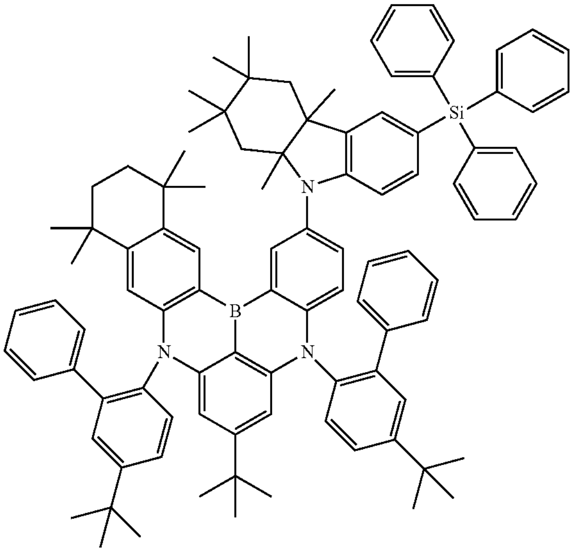

-continued
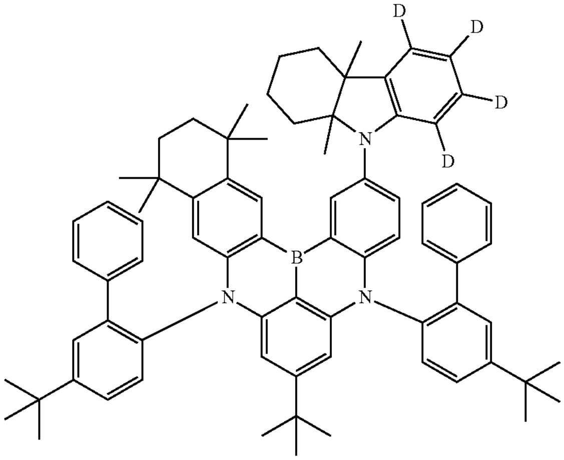
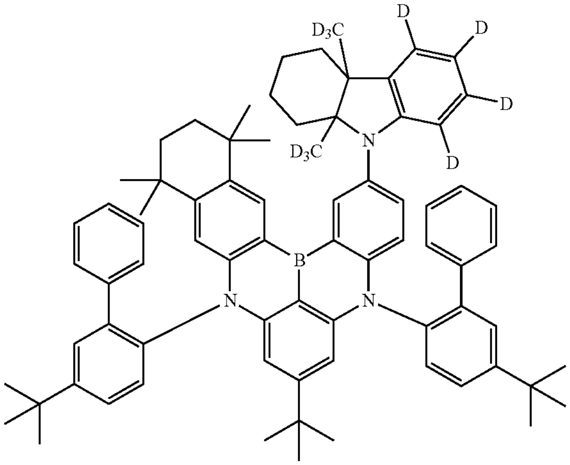
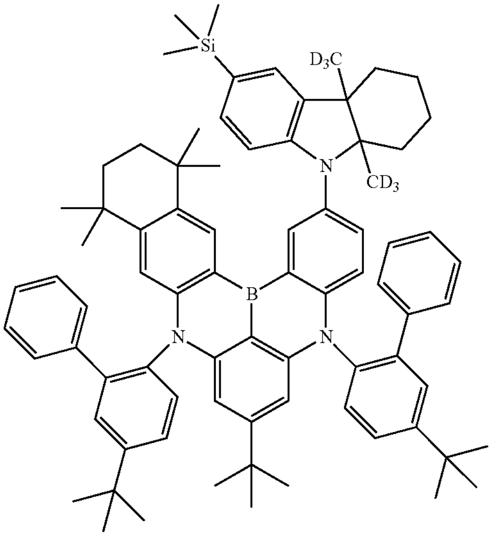
-continued
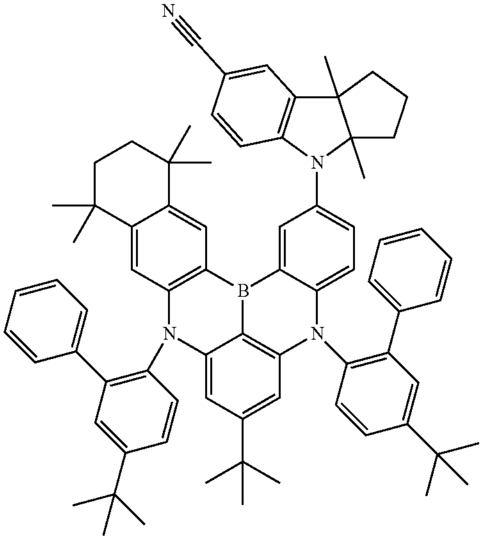
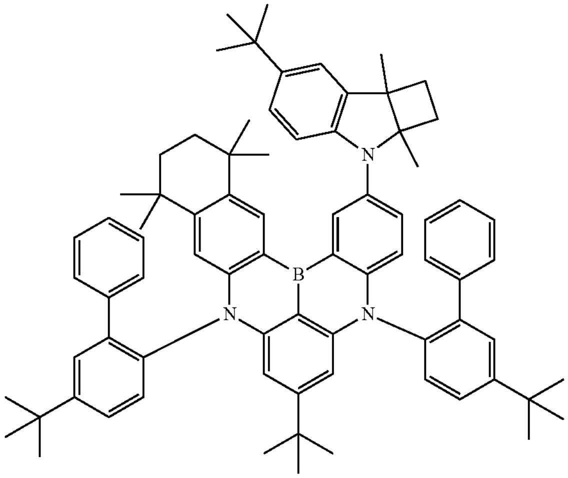
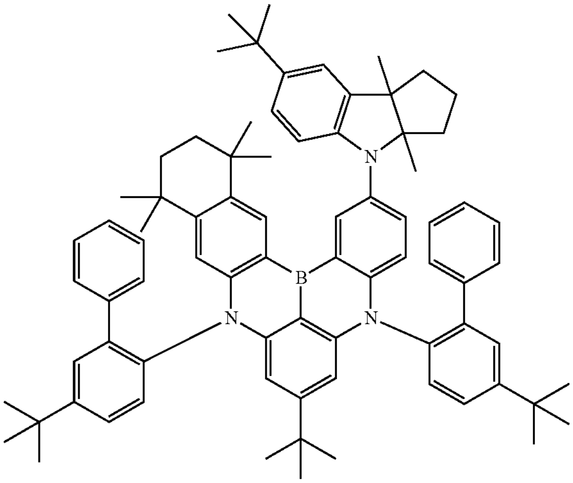

-continued
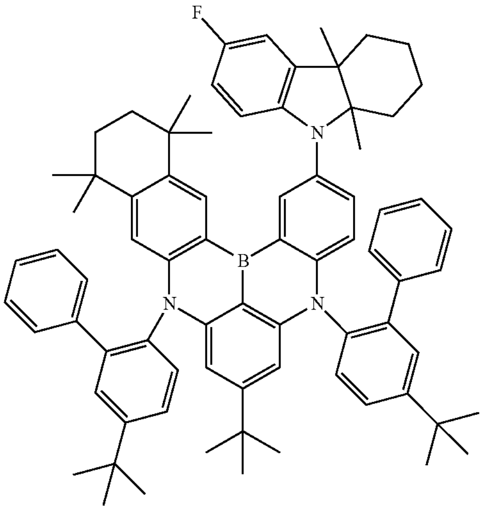
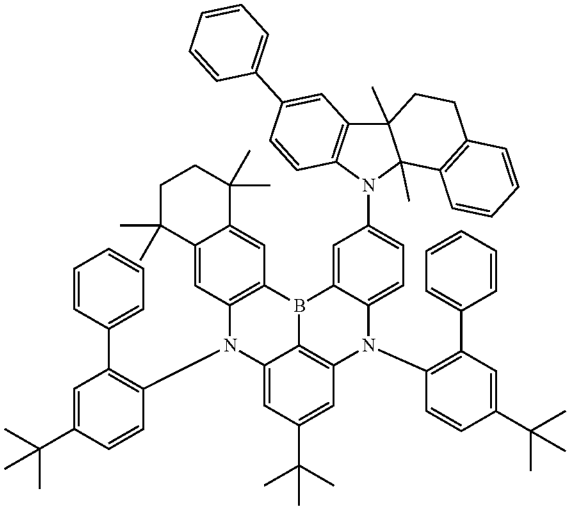
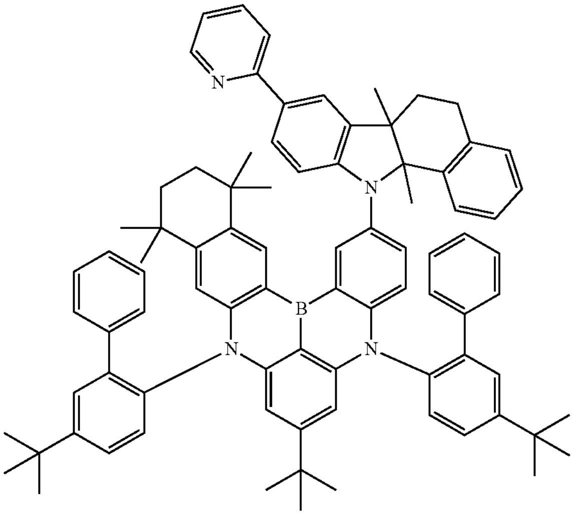
-continued
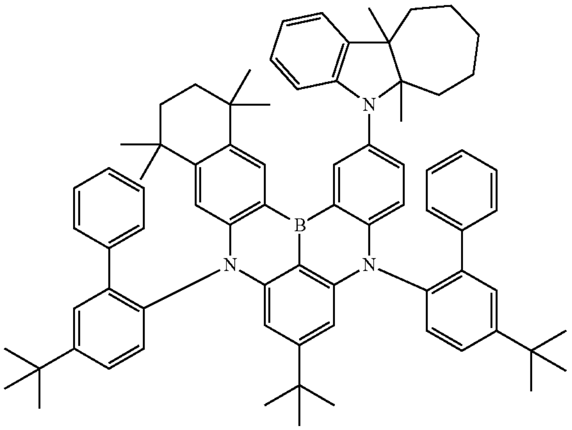
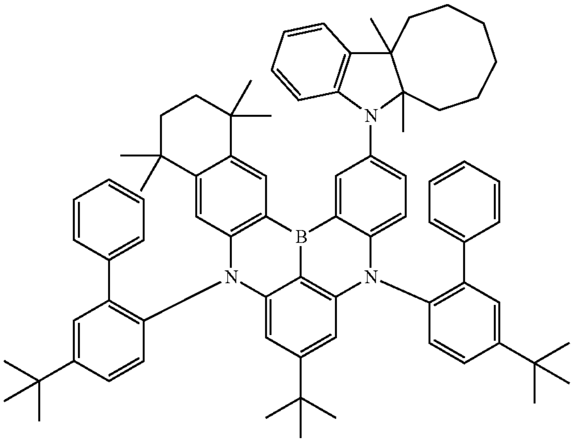
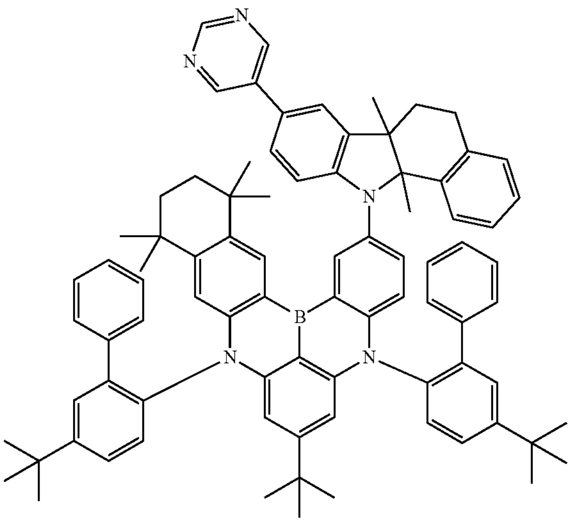

-continued
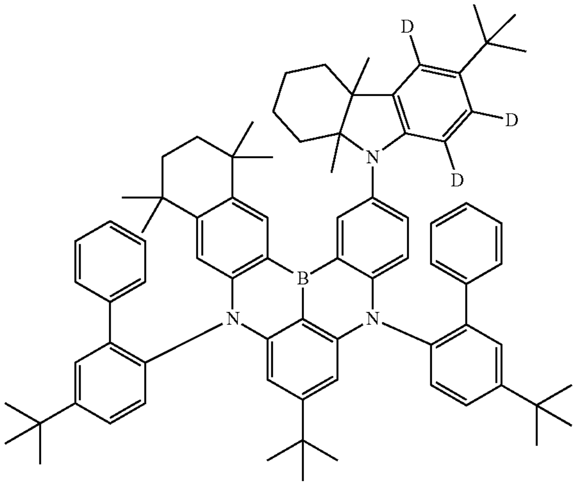
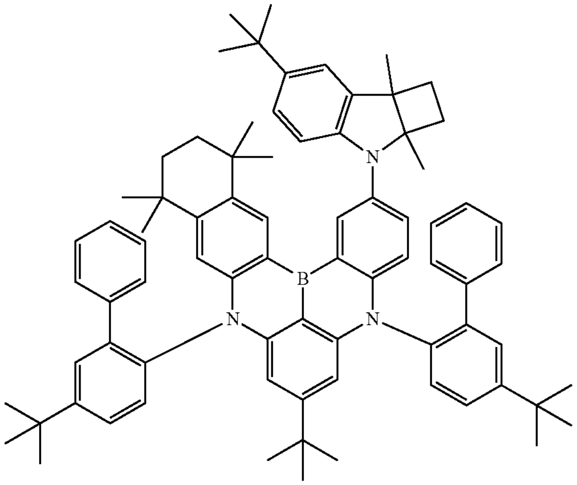
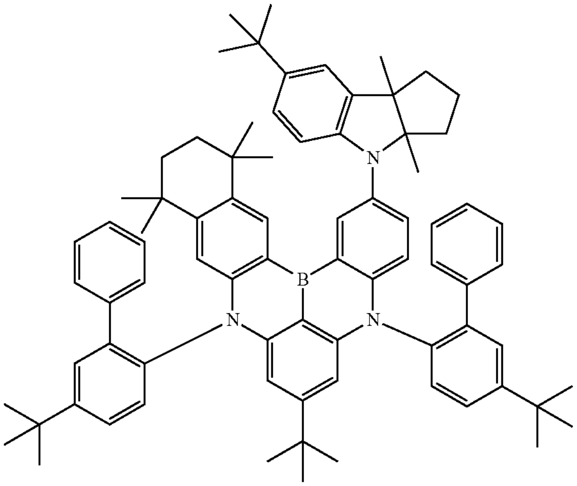
-continued
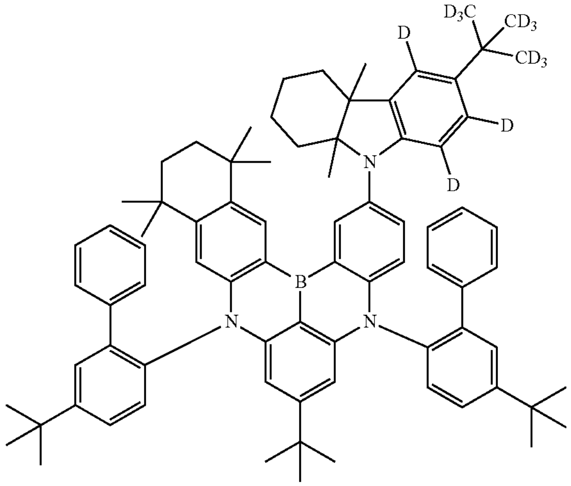
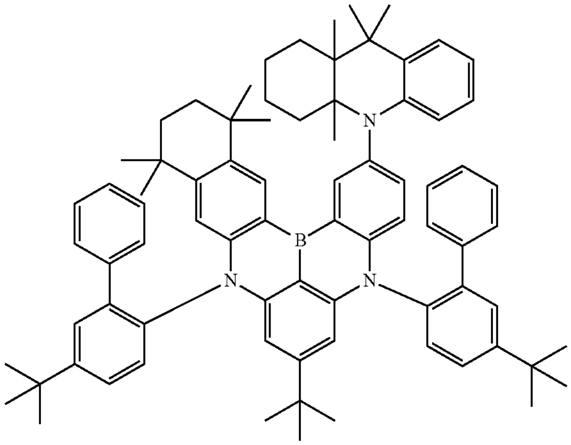
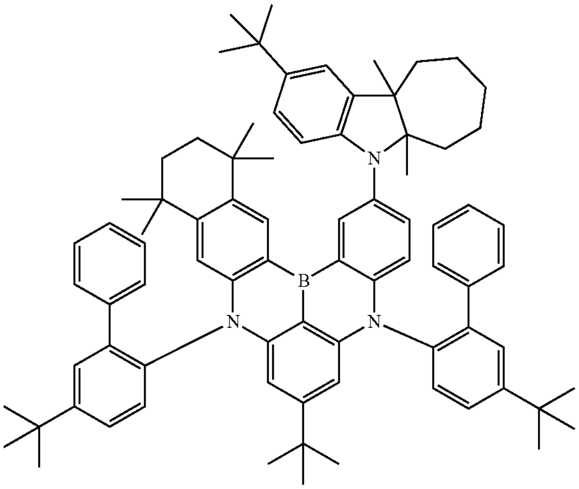

-continued
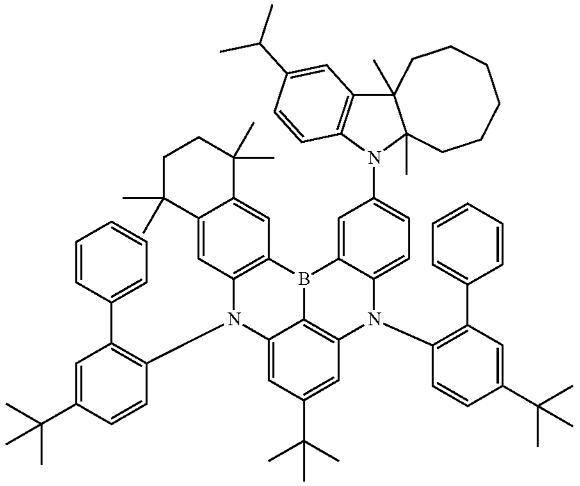
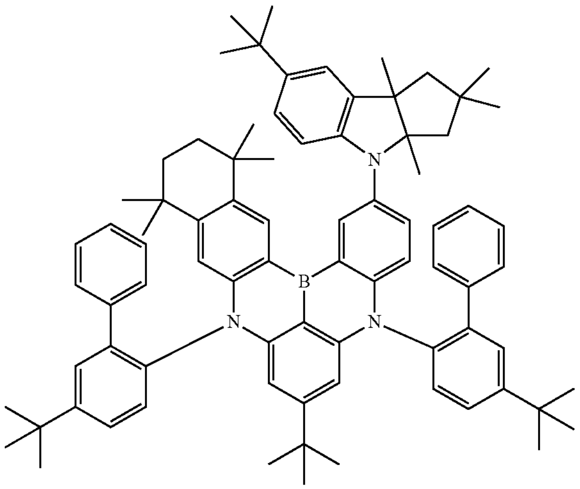
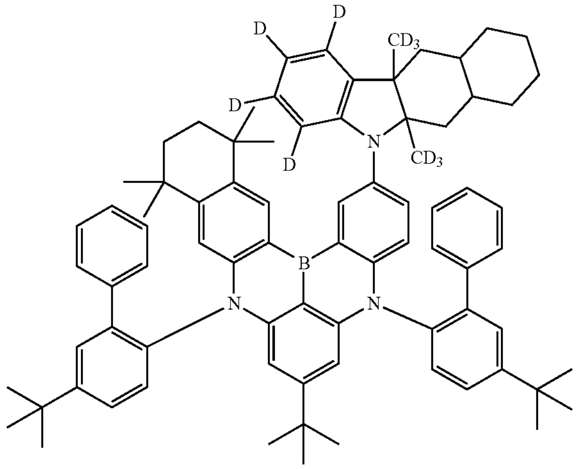
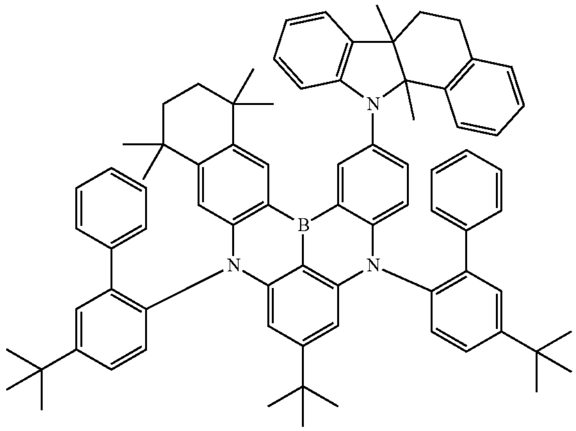
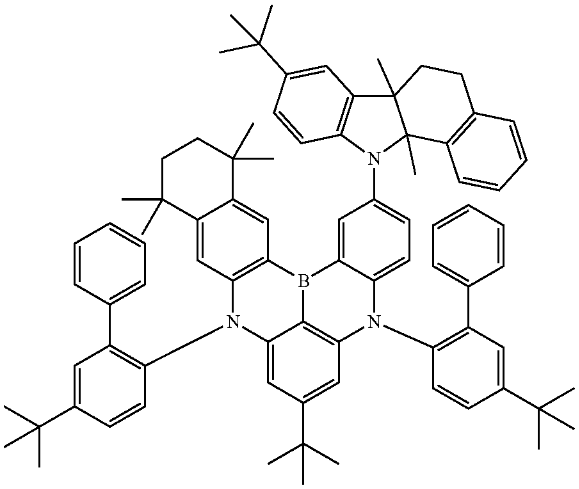
-continued
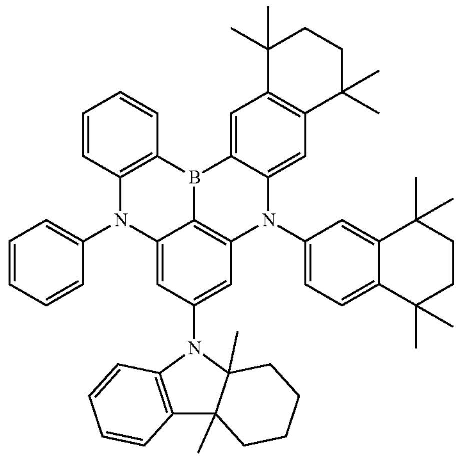

-continued
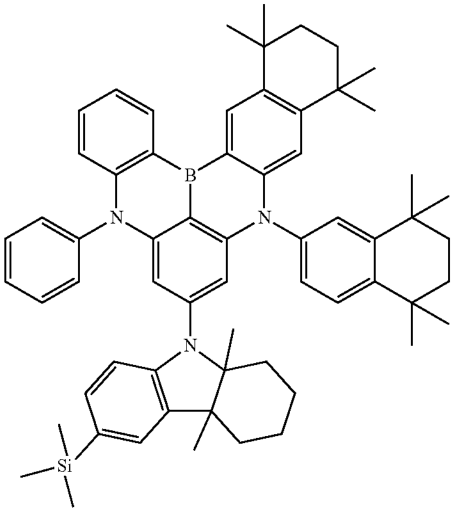
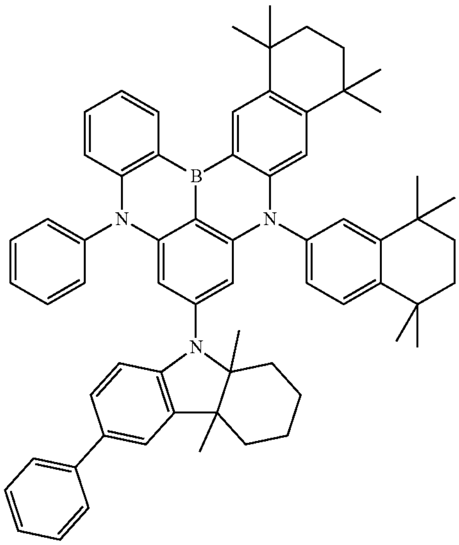
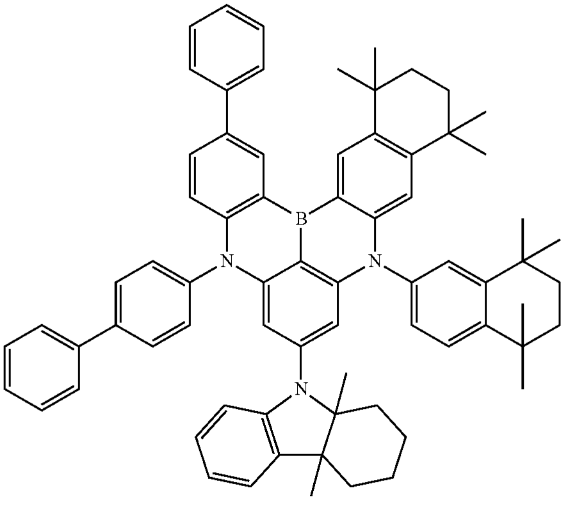
-continued
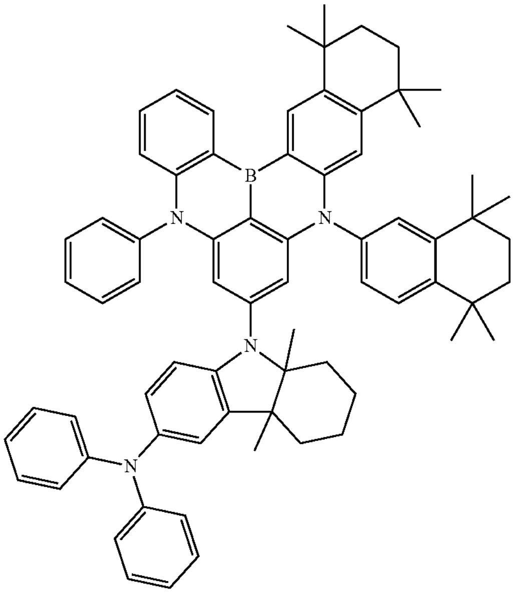
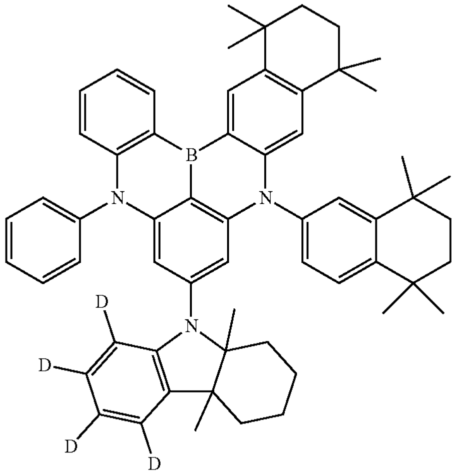
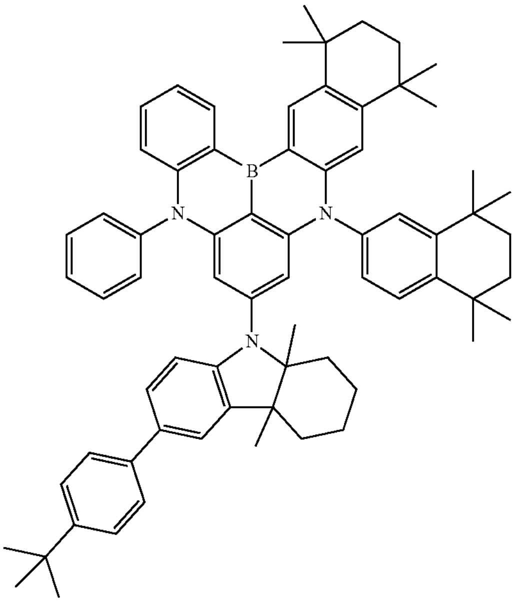

-continued
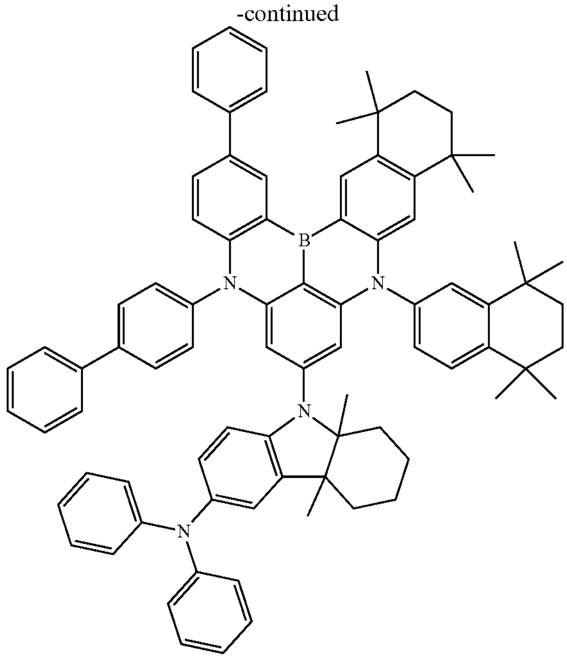
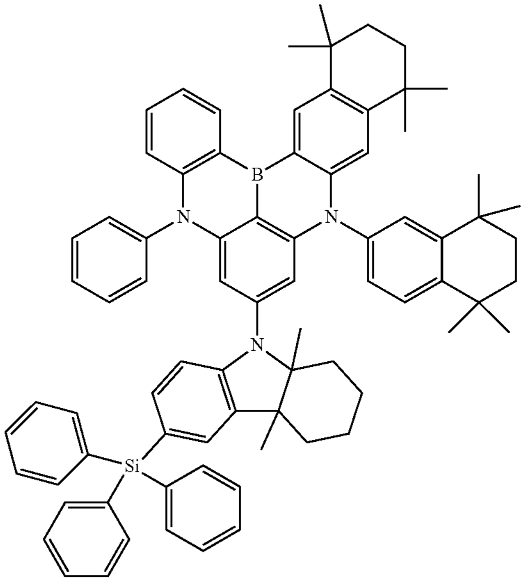
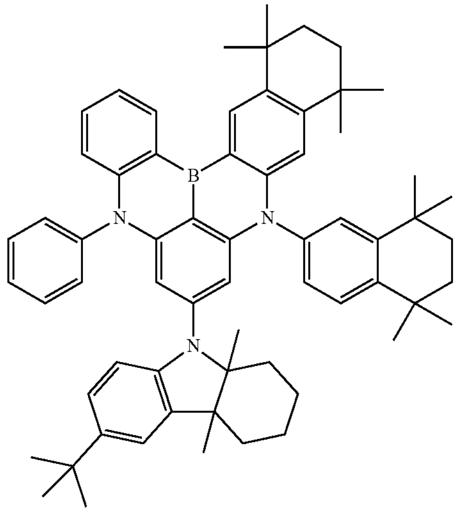
-continued
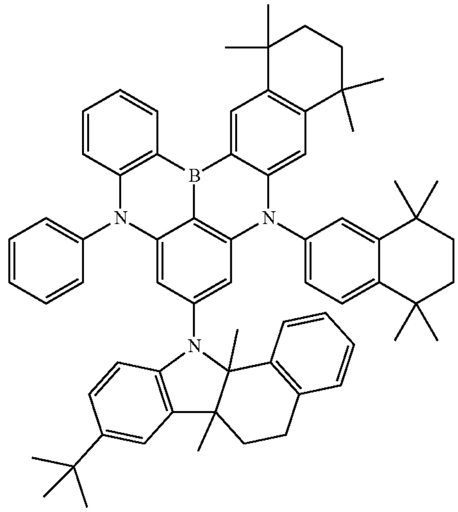
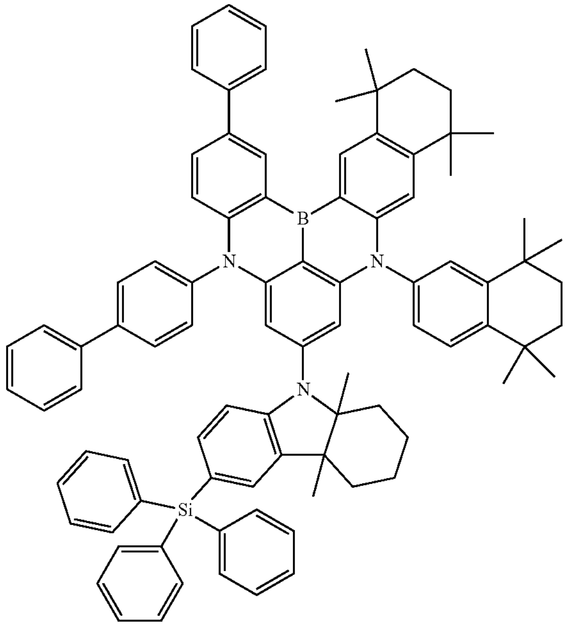
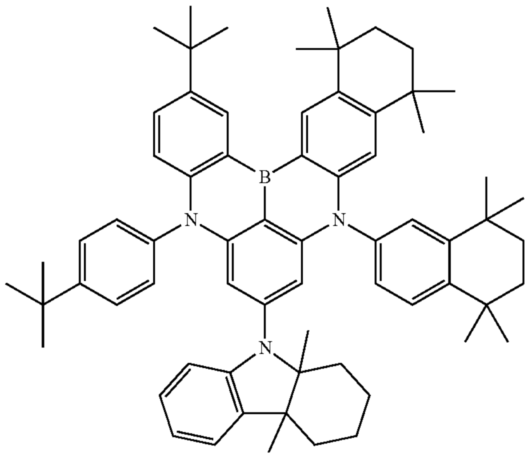

-continued
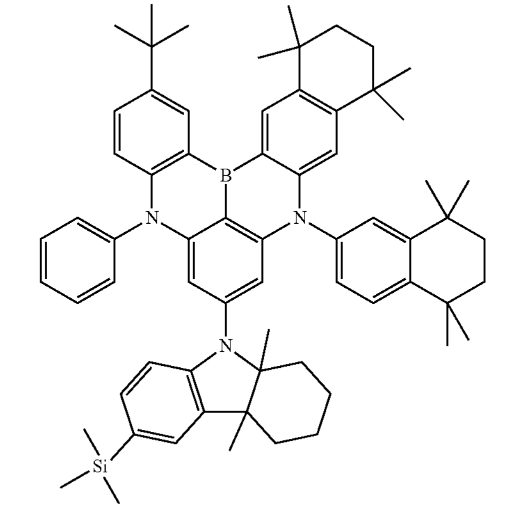
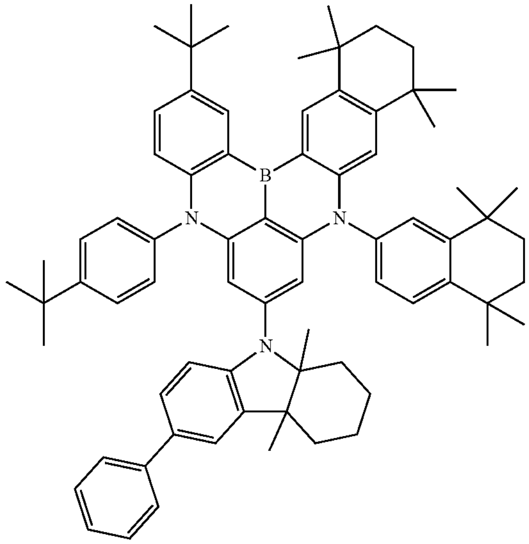
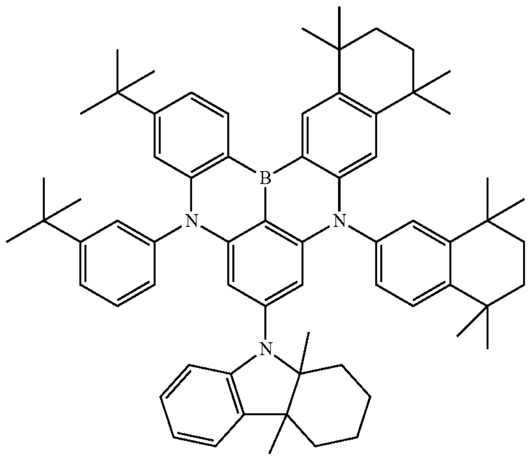
-continued
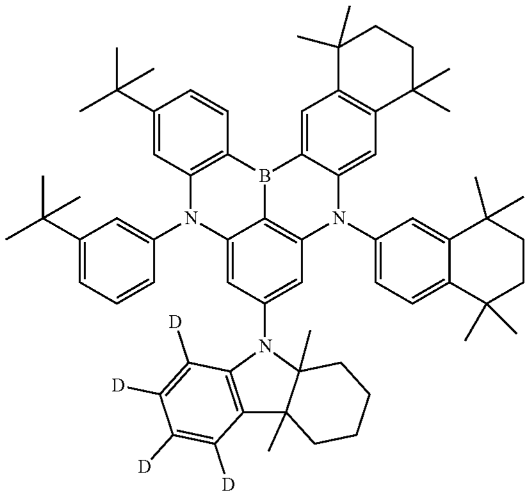
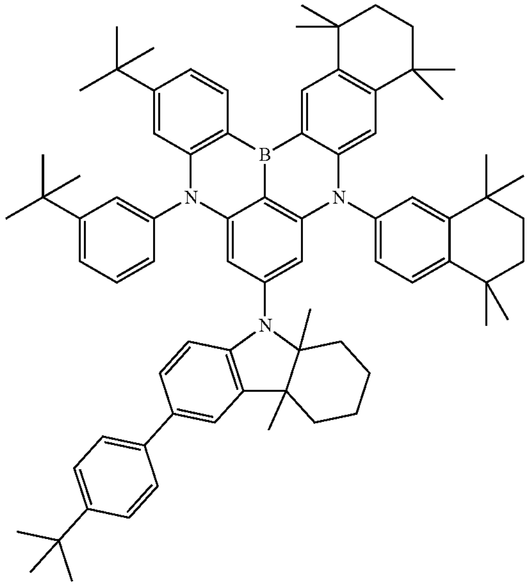
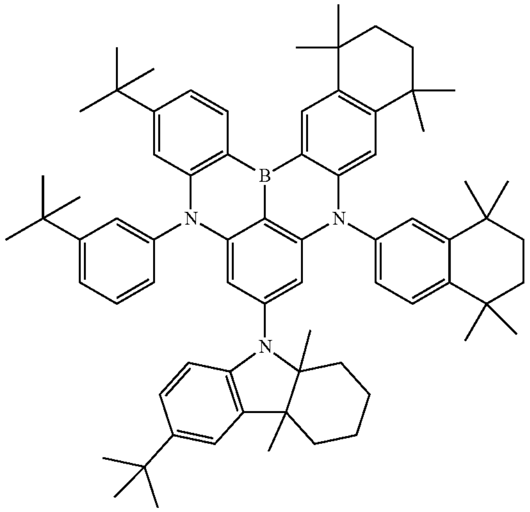

-continued
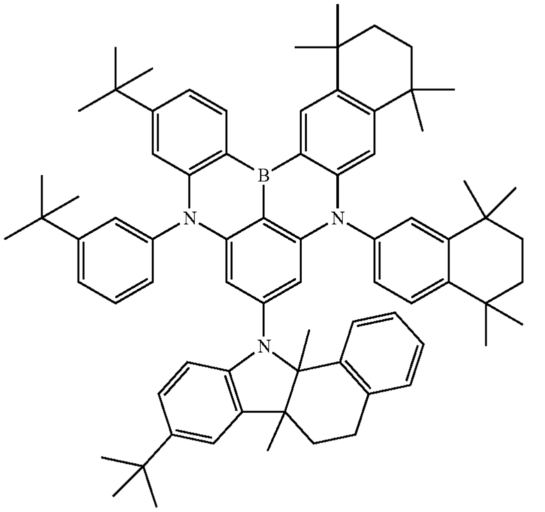
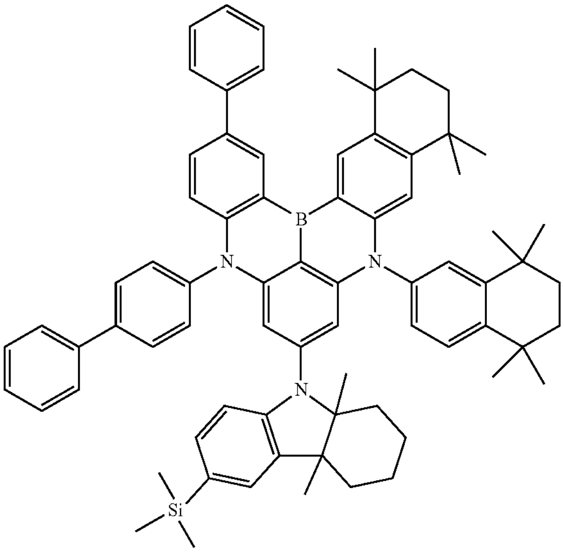
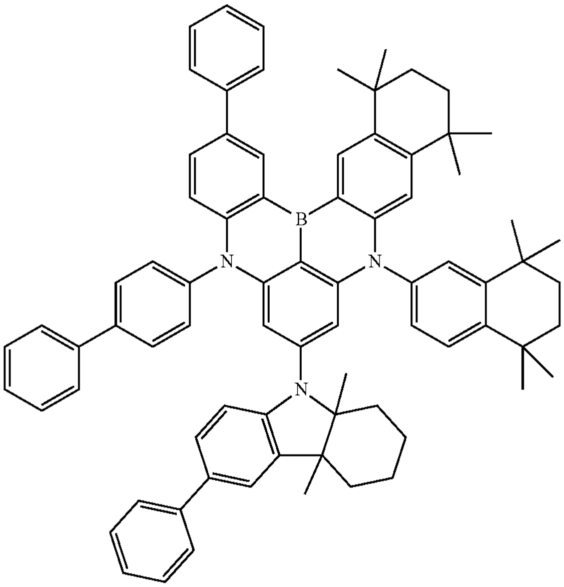
-continued
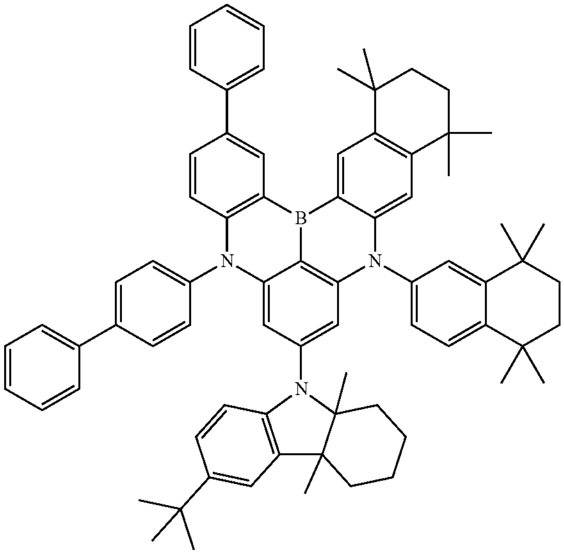
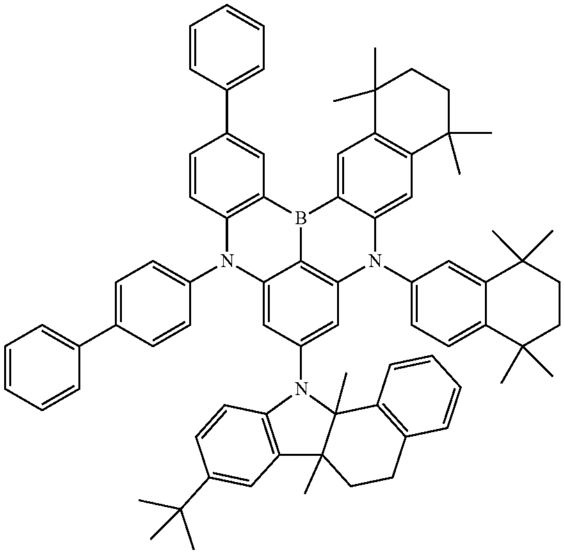
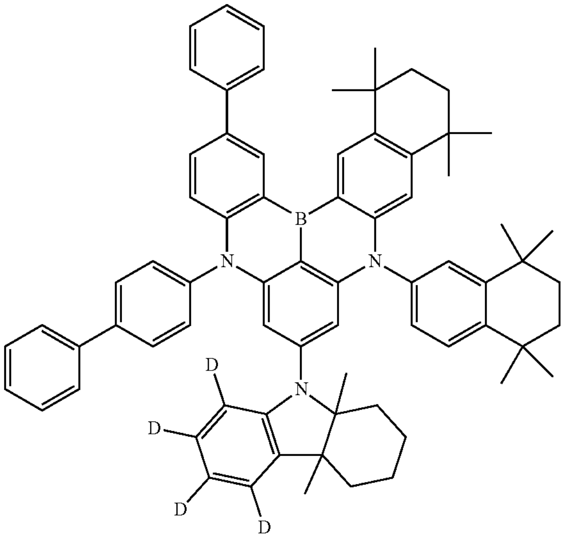

-continued
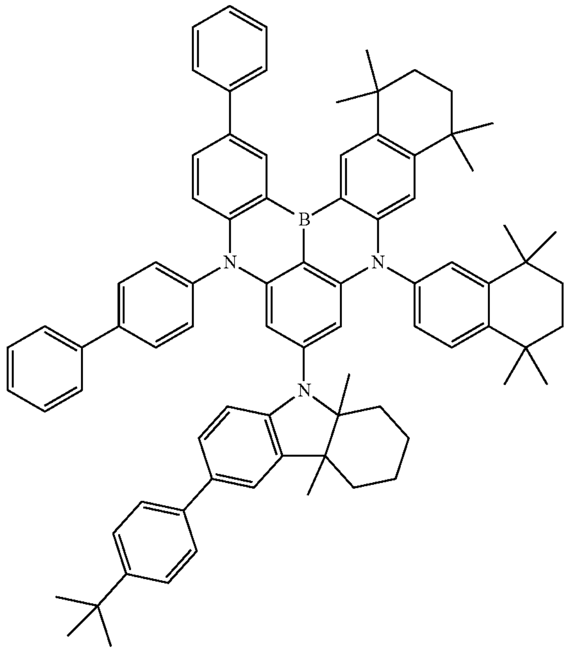
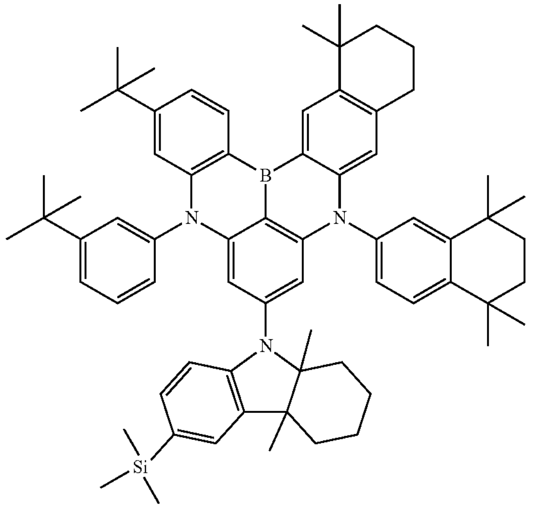
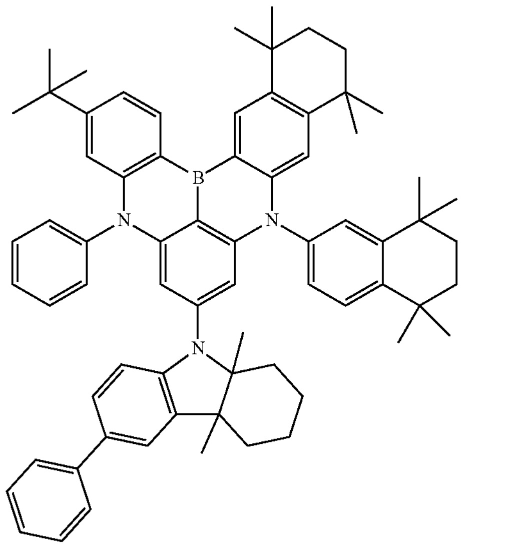
-continued
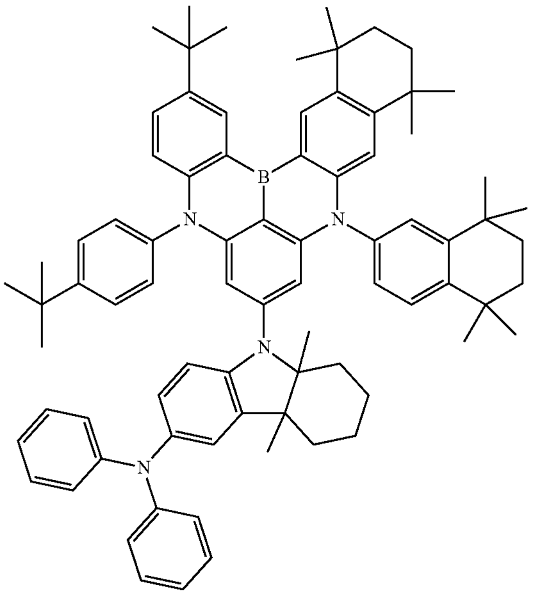
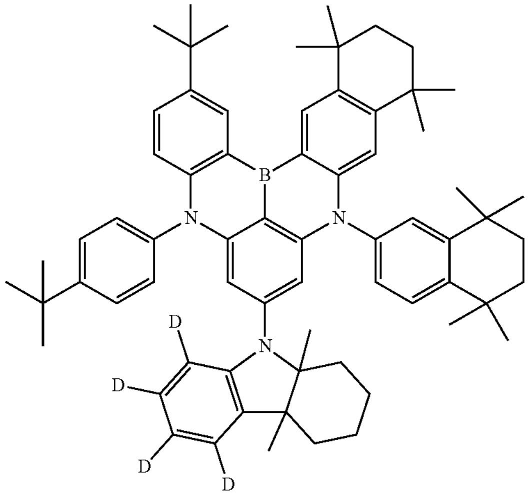
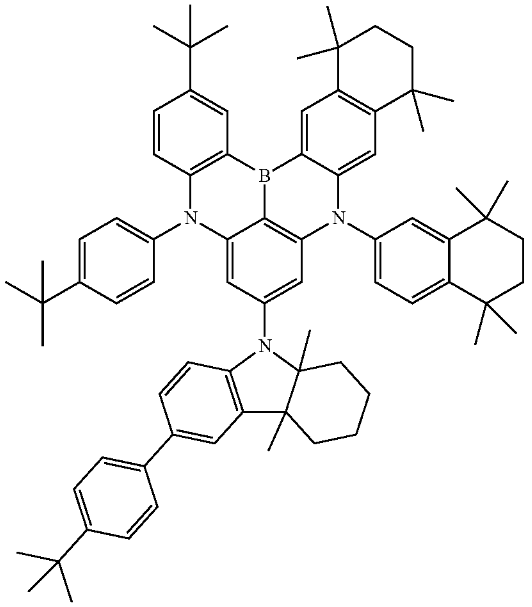

-continued
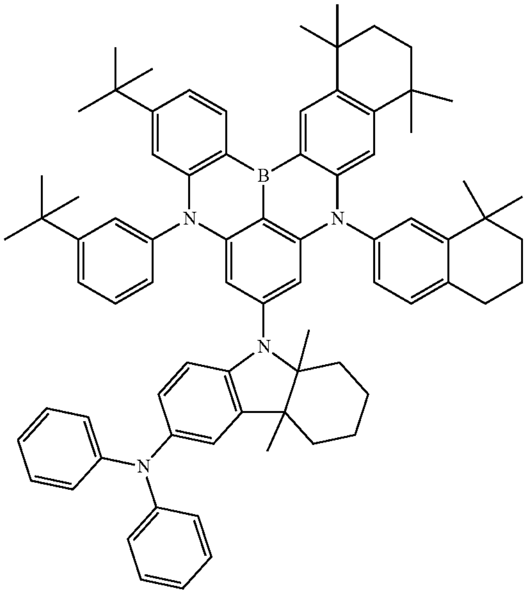
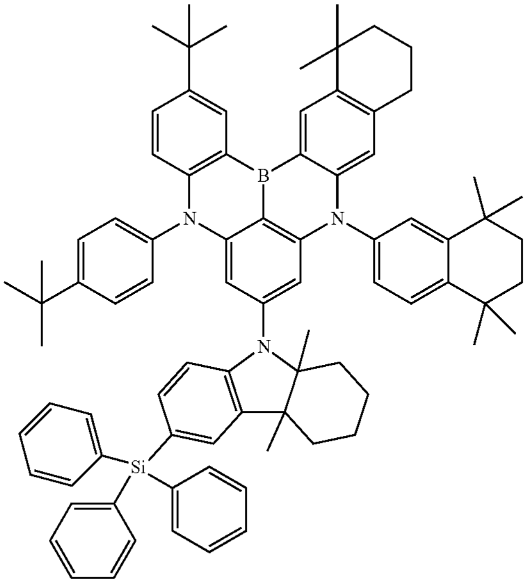
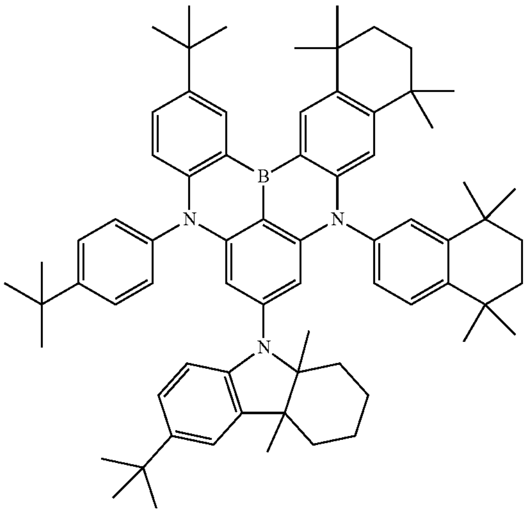
-continued
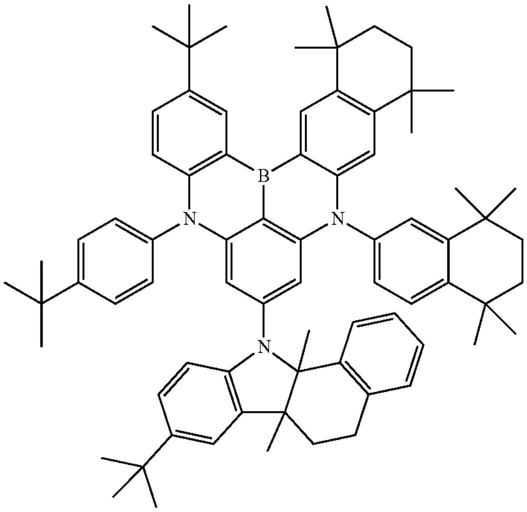
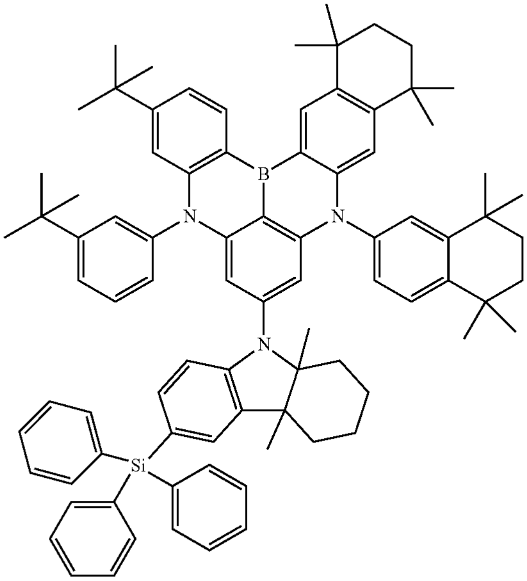
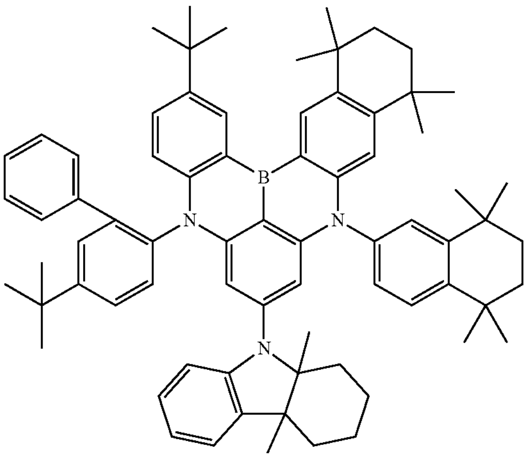

-continued
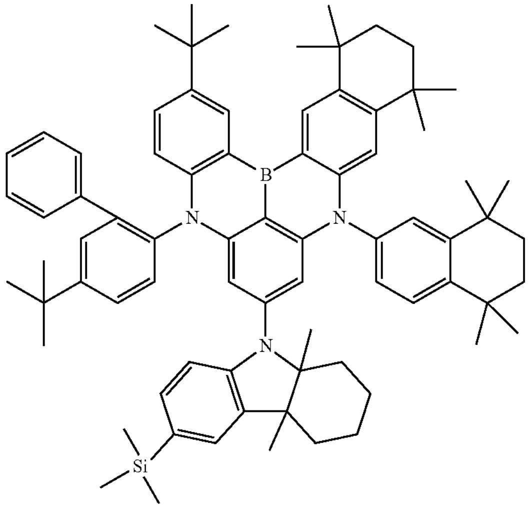
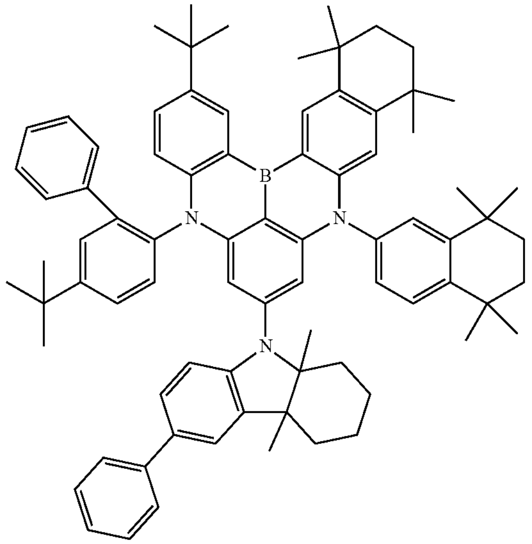
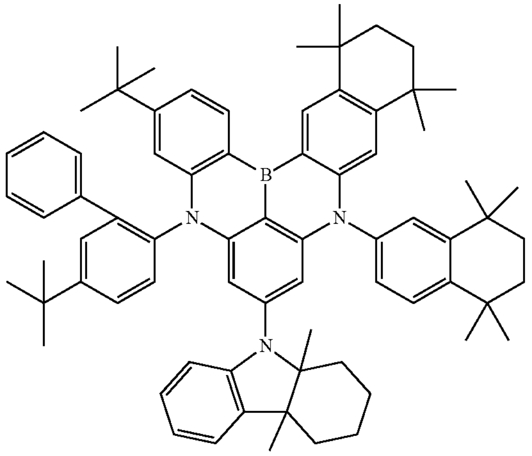
-continued
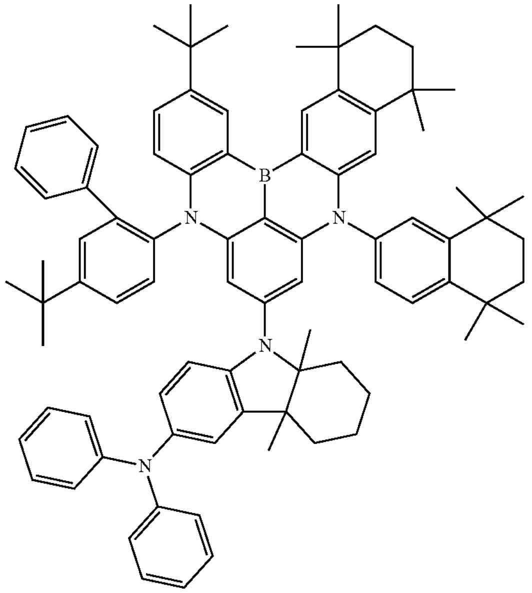
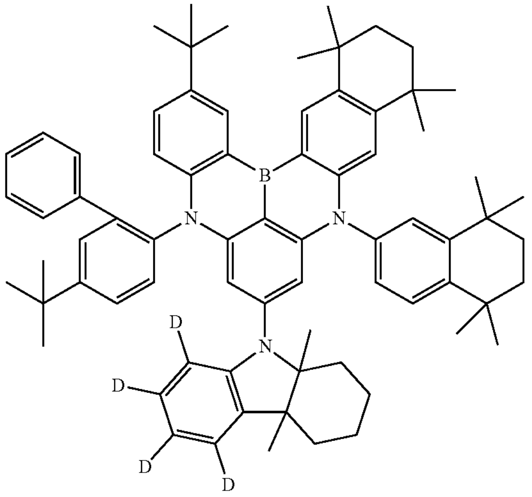
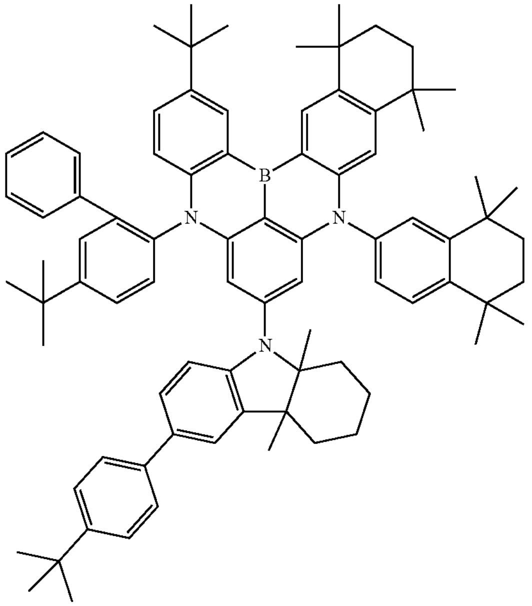

-continued
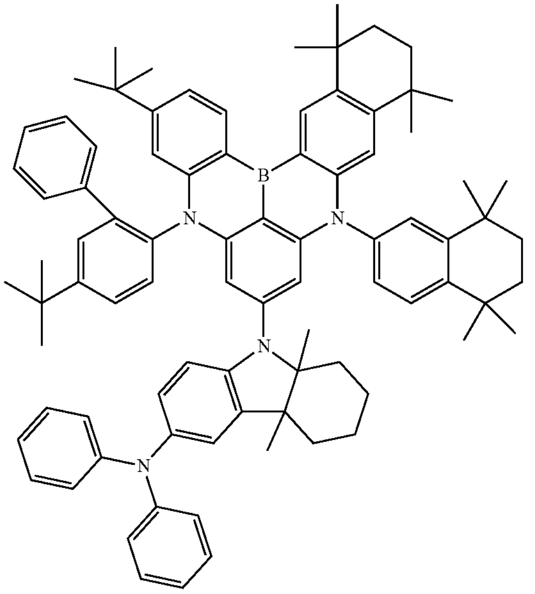
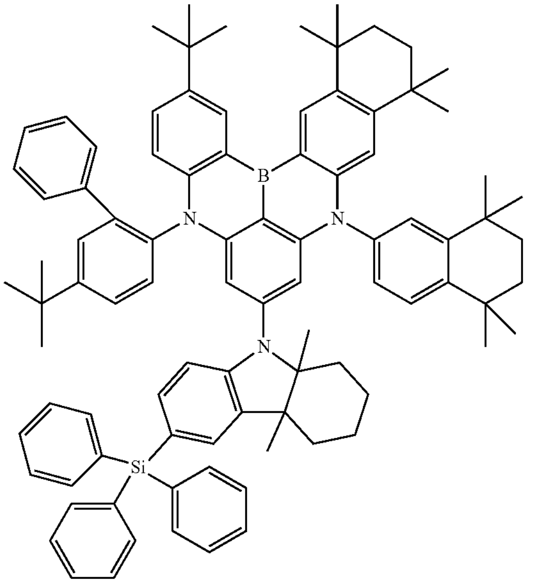
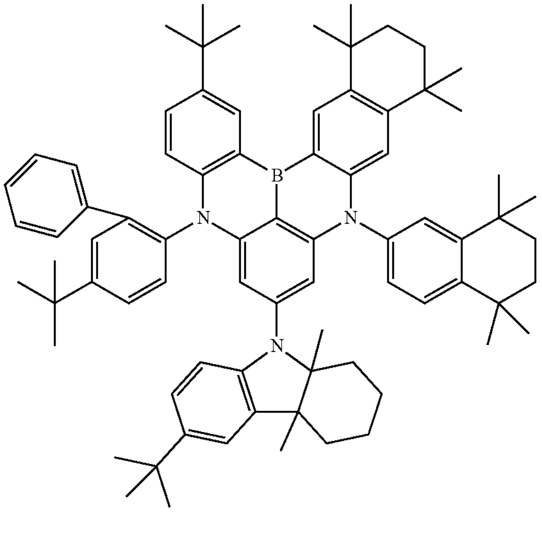
-continued
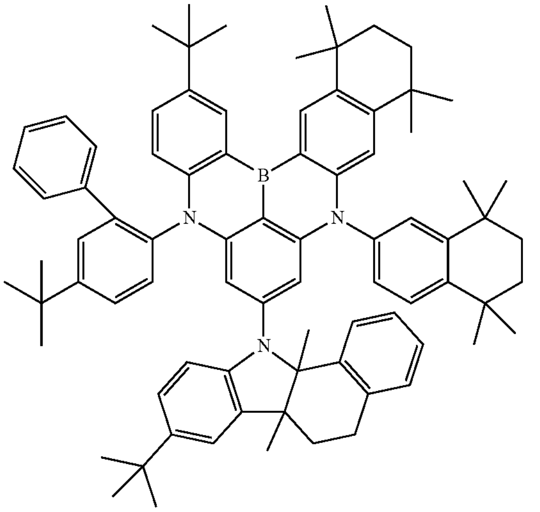
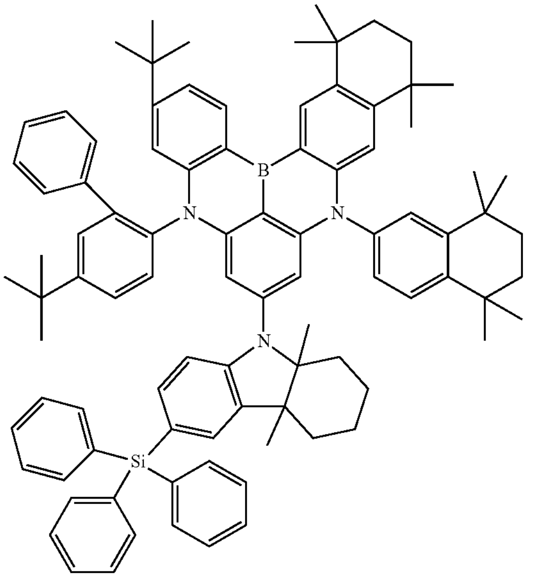
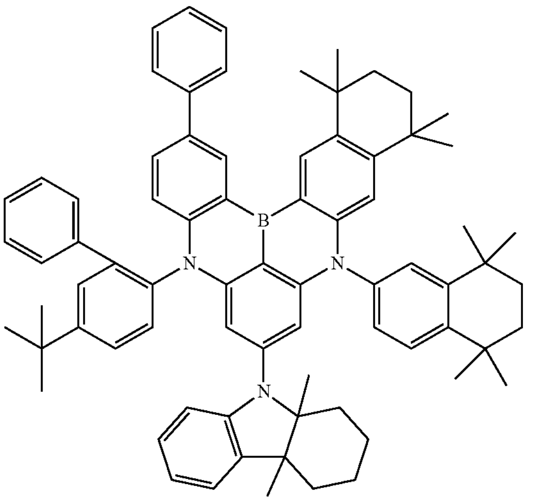

-continued
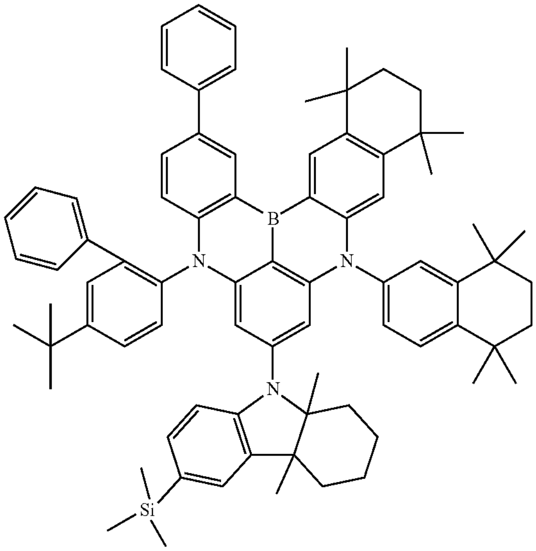
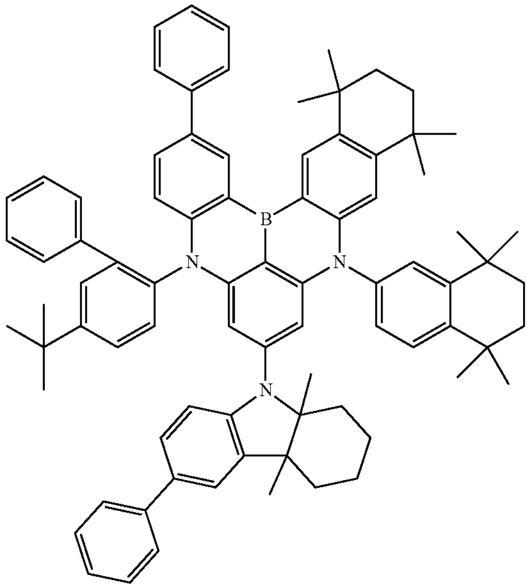
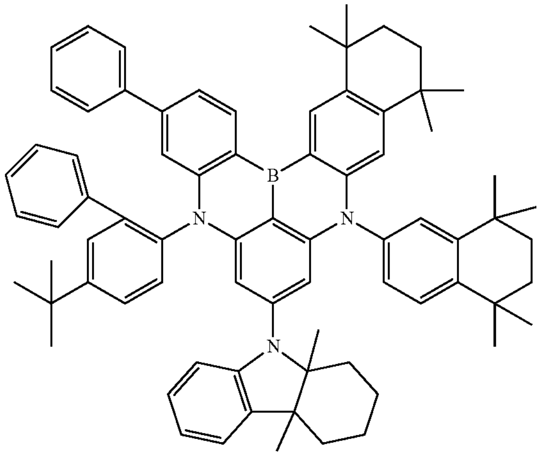
-continued
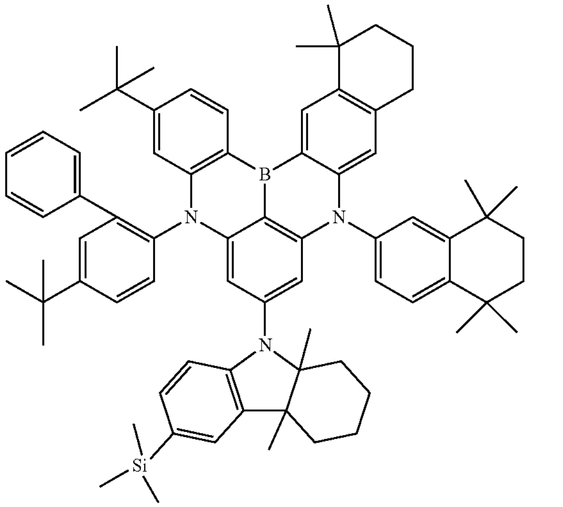
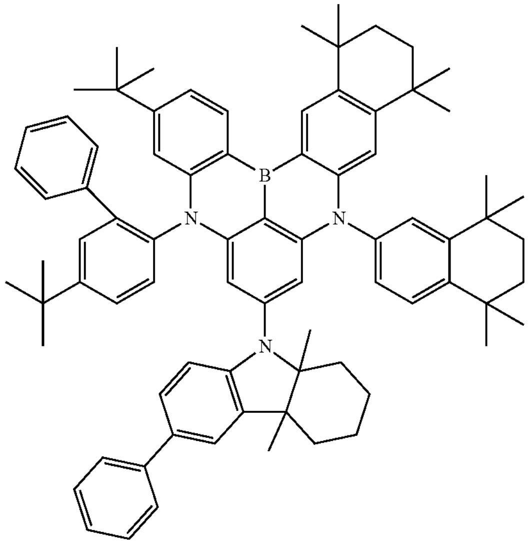
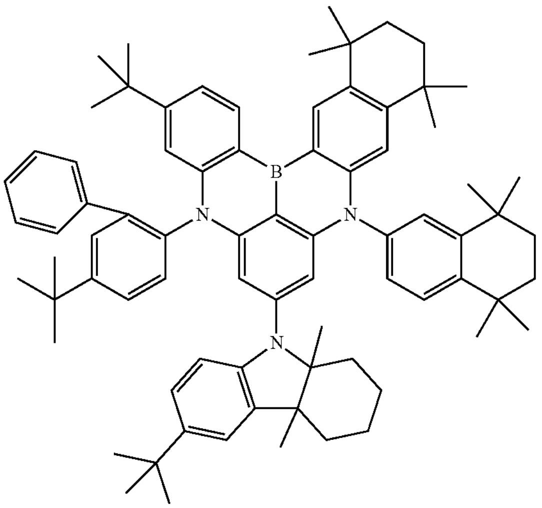

-continued
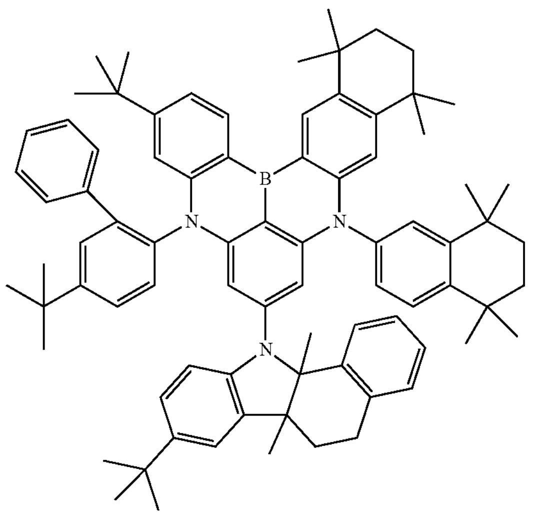
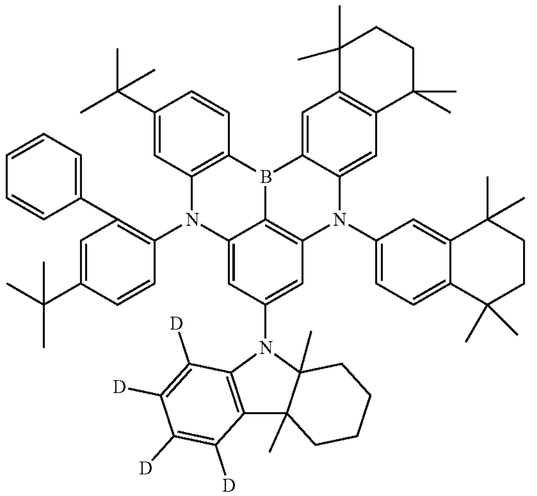
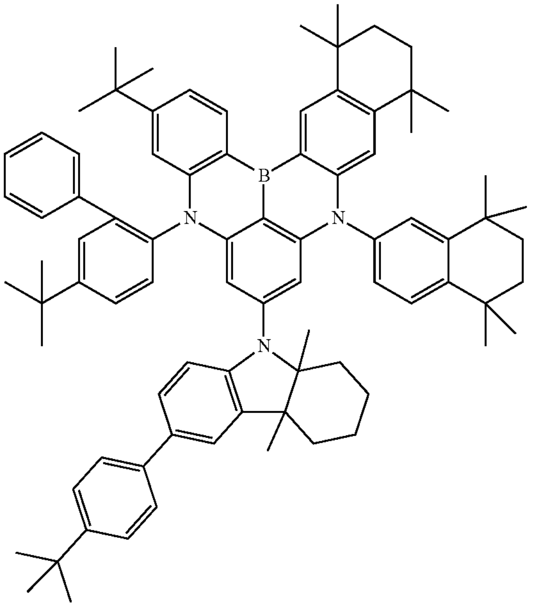
-continued
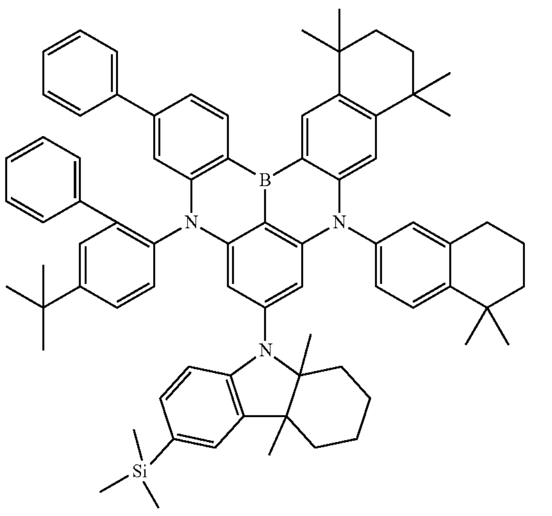
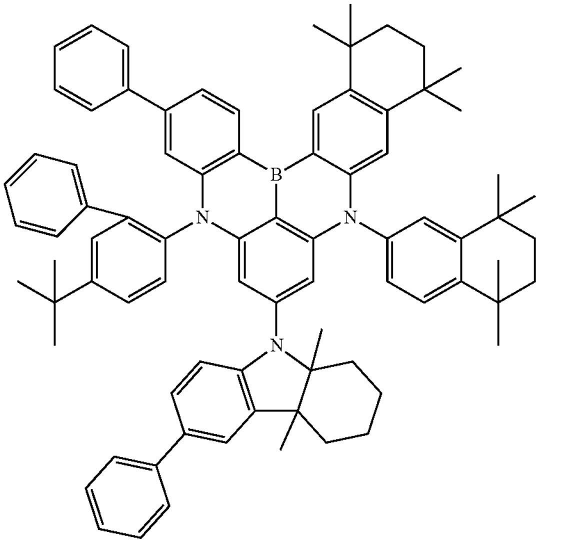
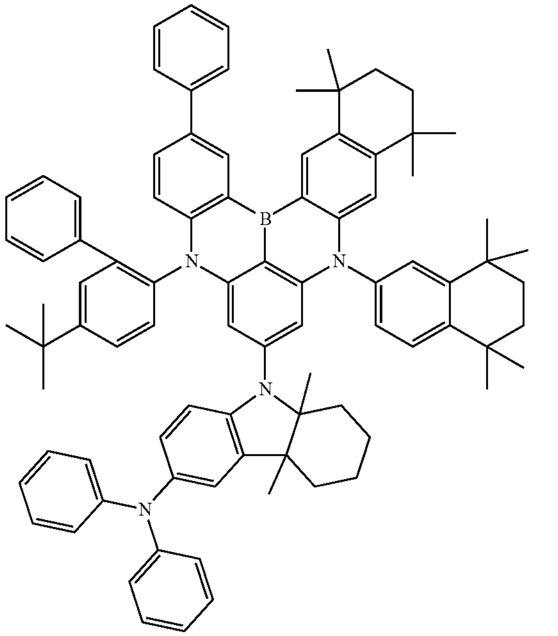

-continued
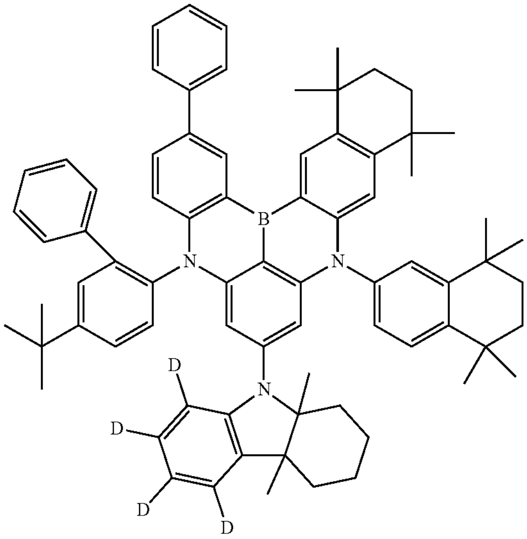
-continued
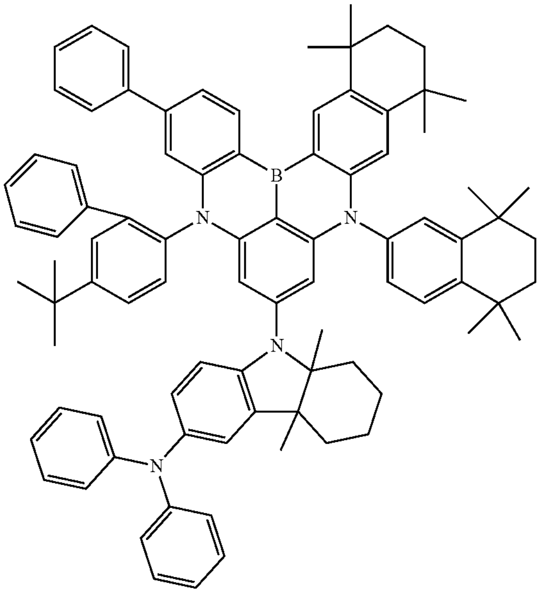
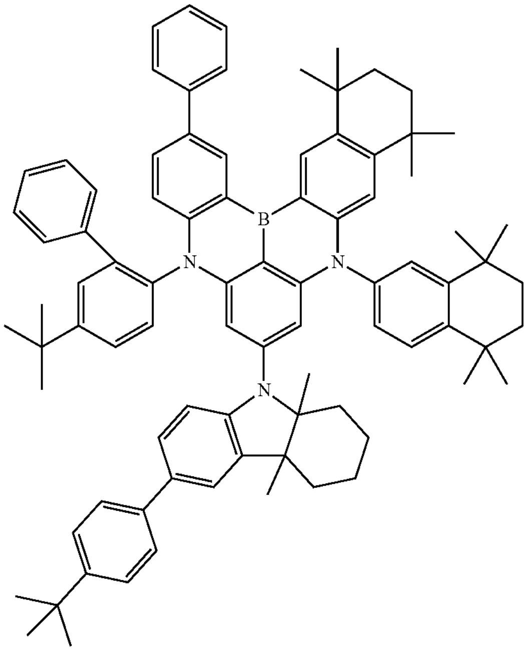
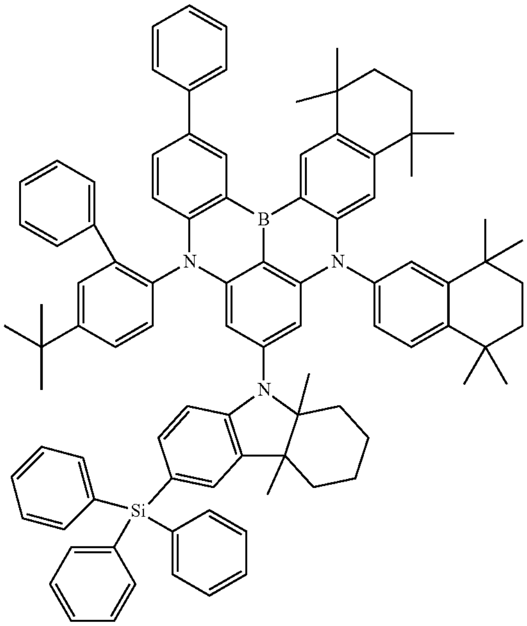

-continued
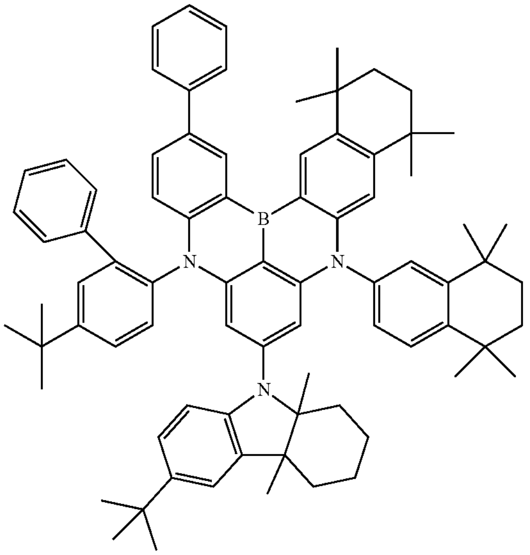
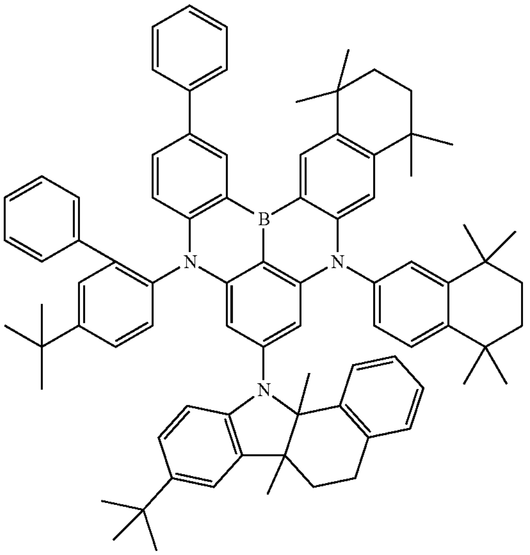
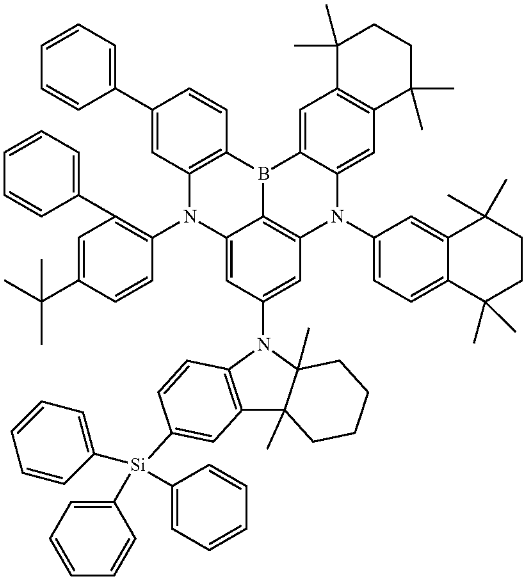
-continued
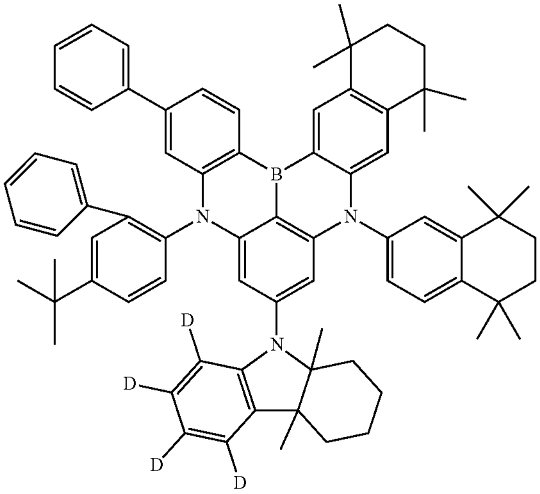
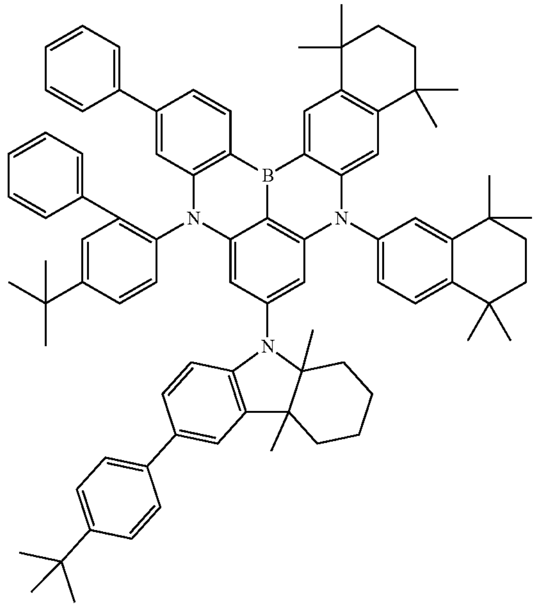
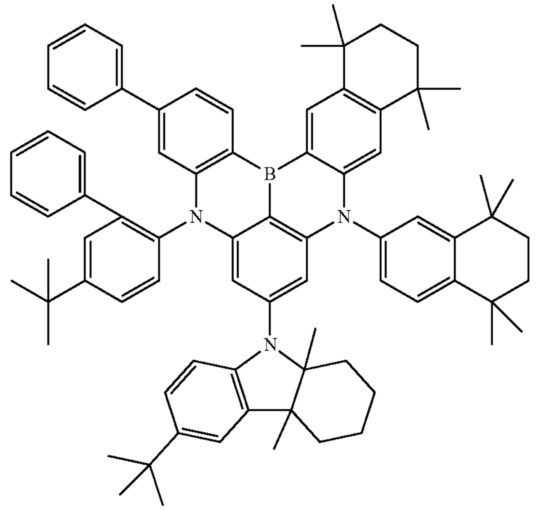

-continued
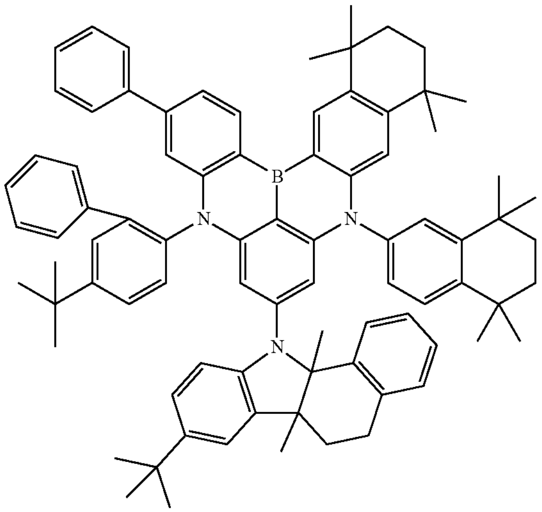
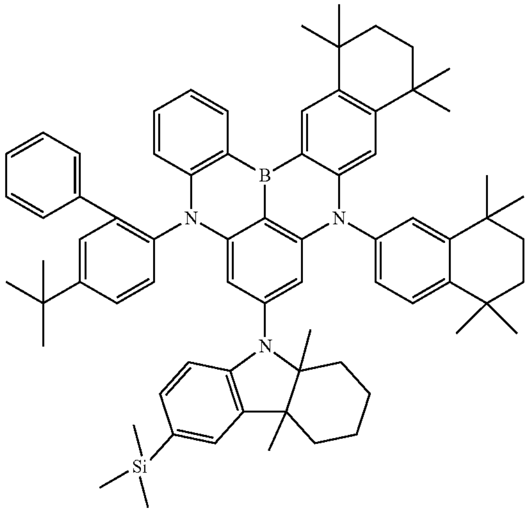
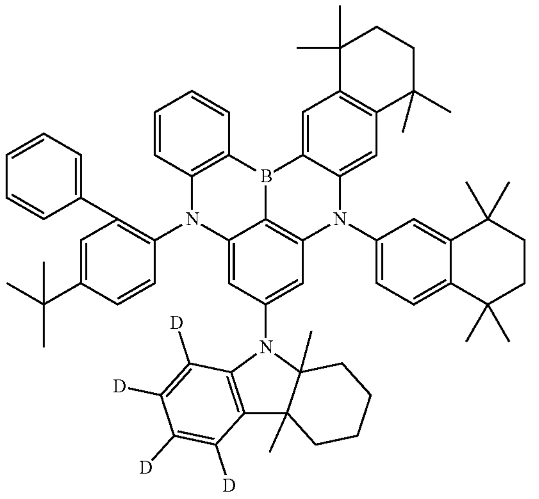
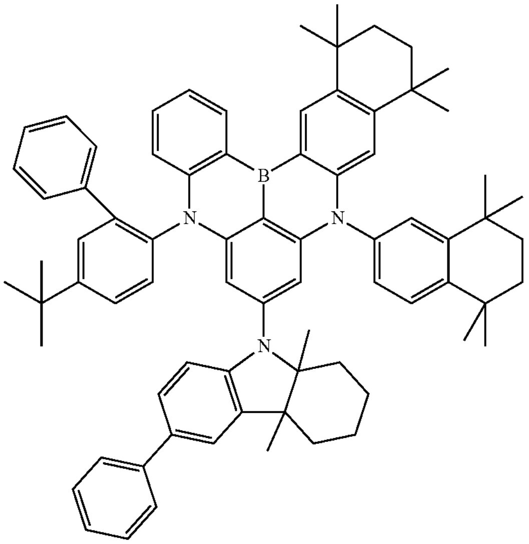
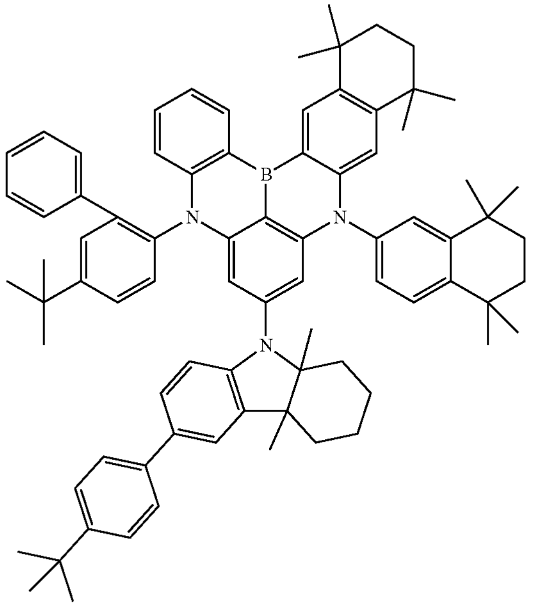
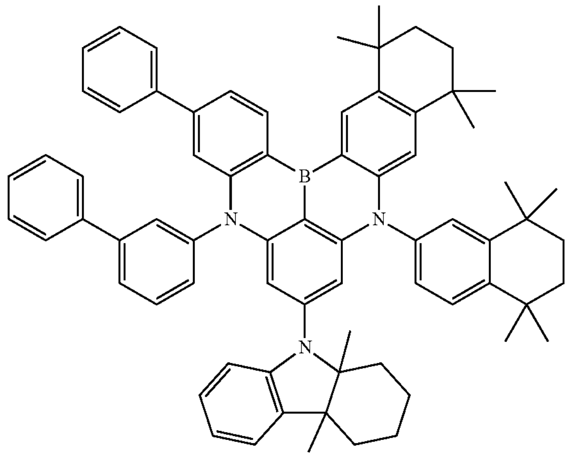
-continued -continued
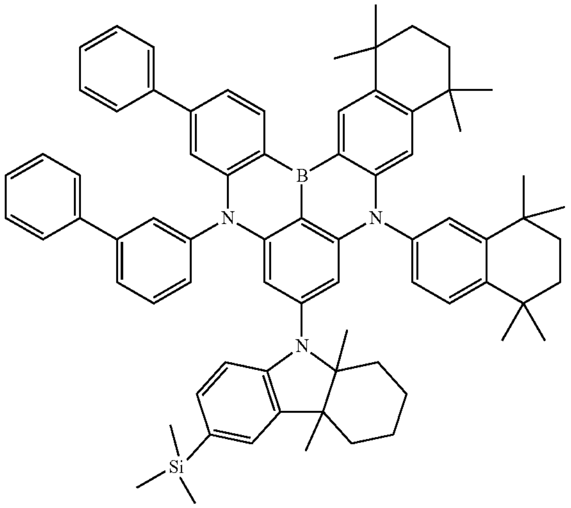
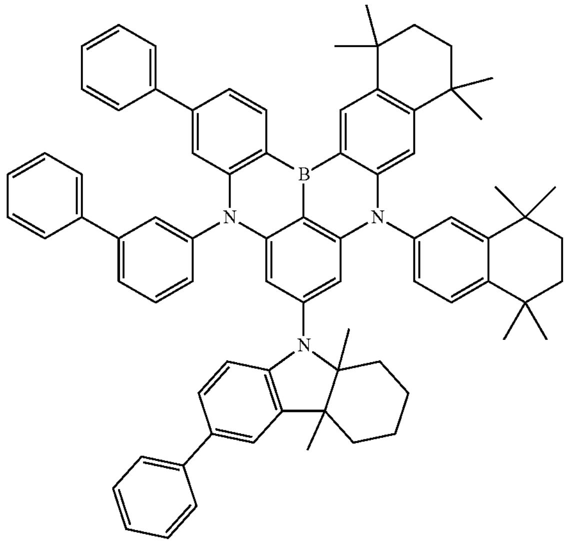
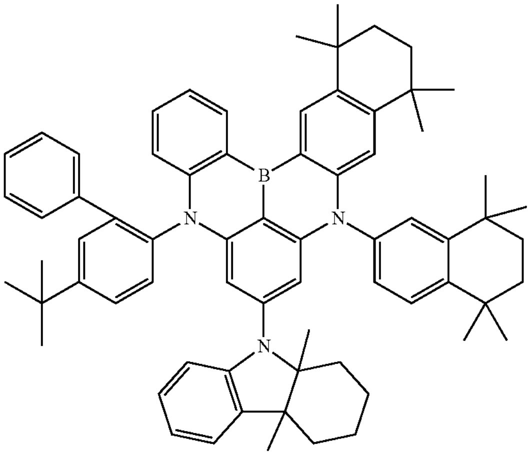
-continued
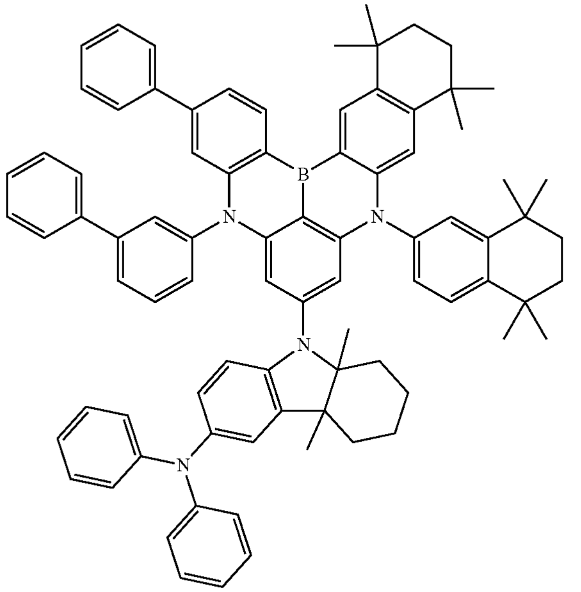
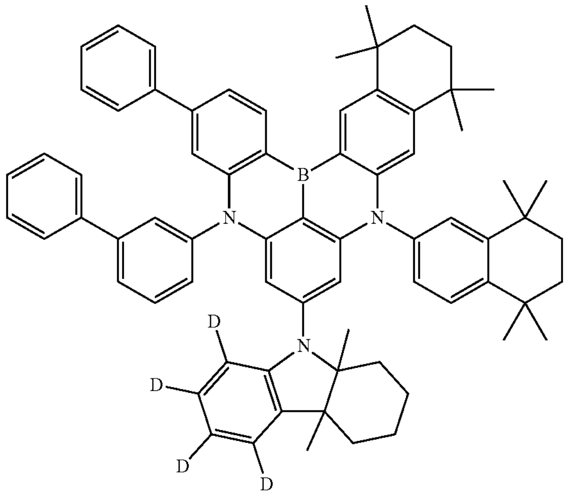
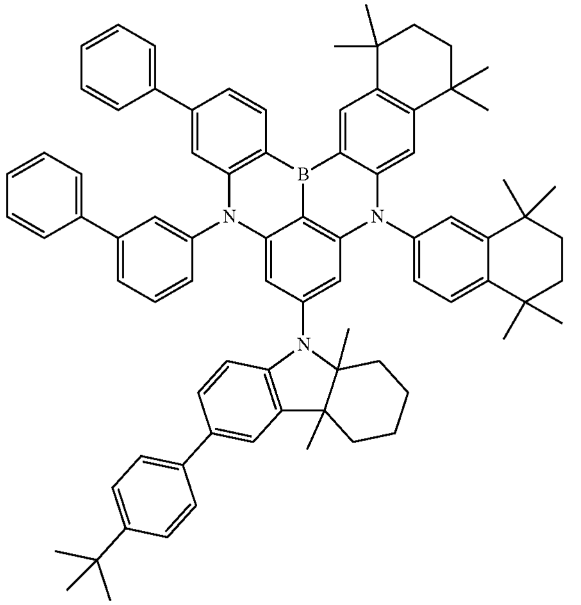

-continued
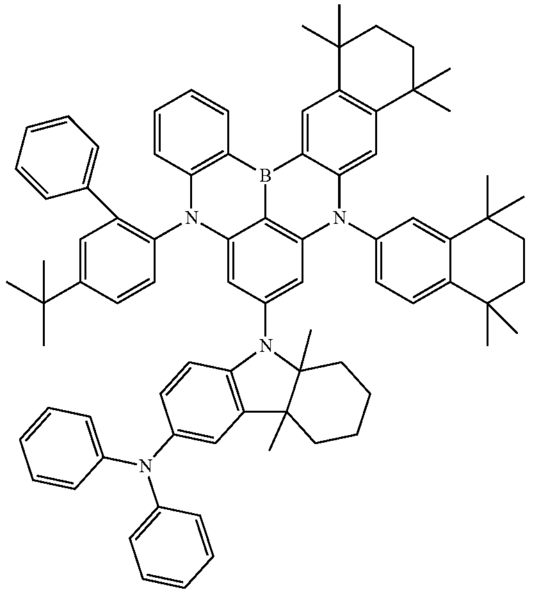
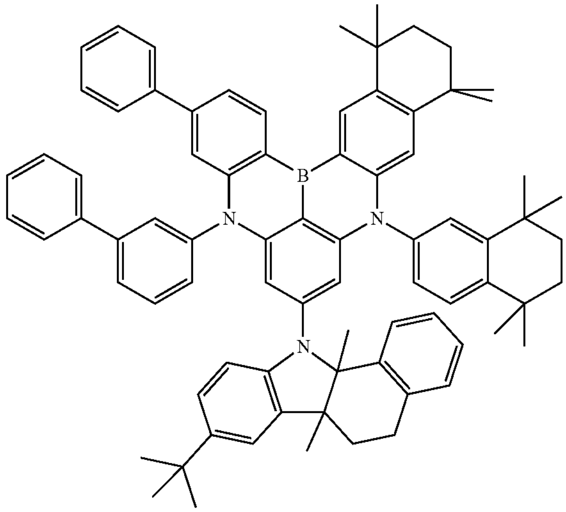
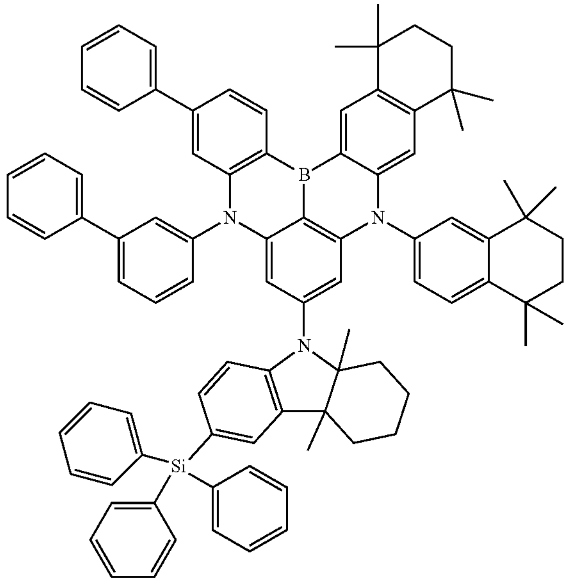
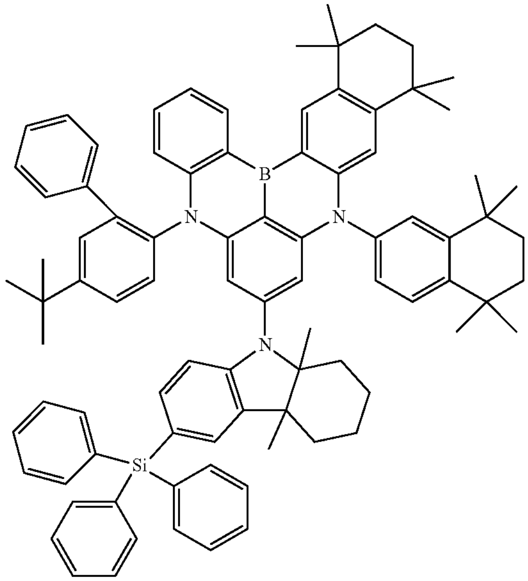
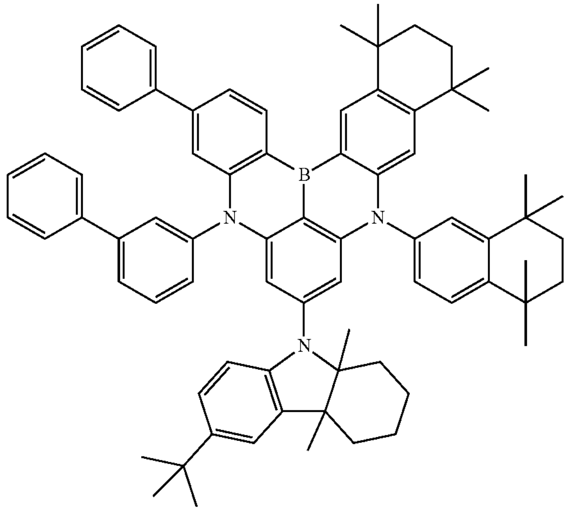
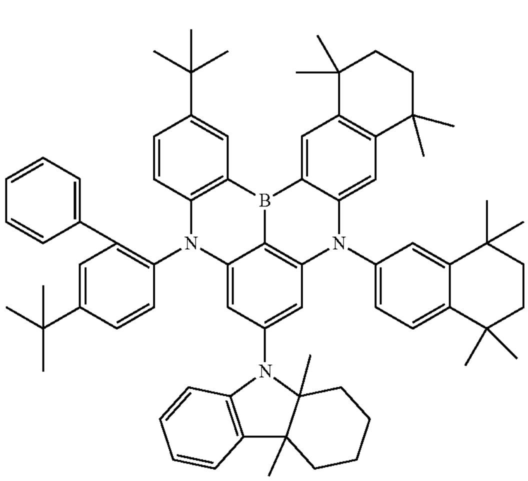

-continued
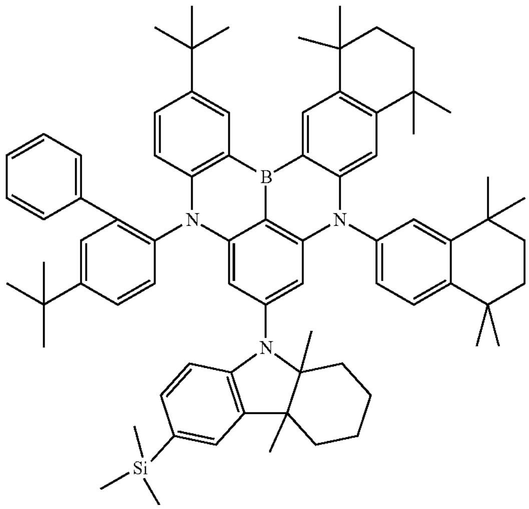
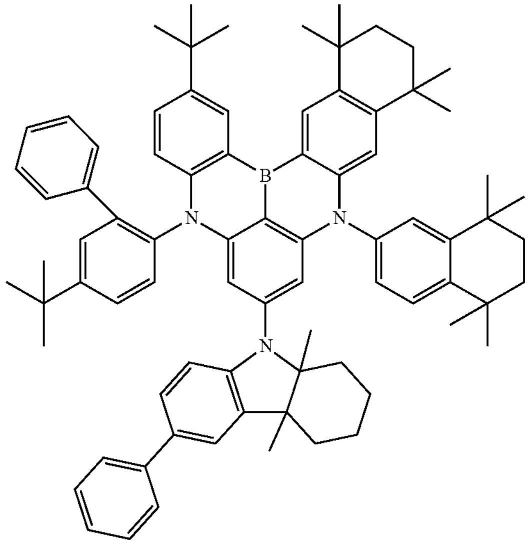
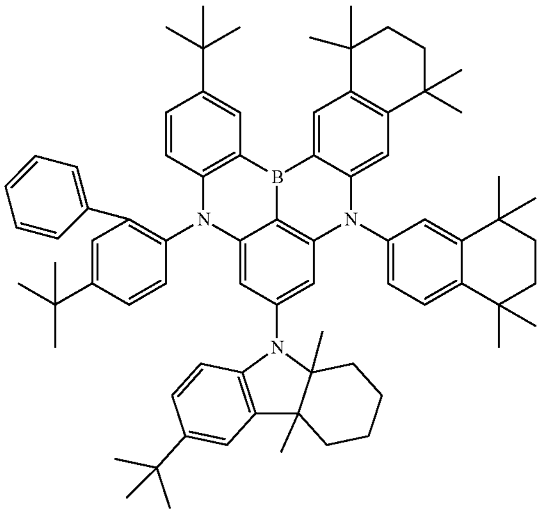
-continued
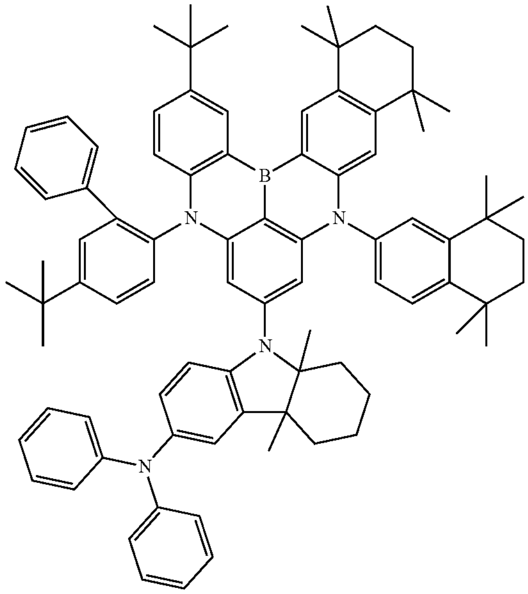
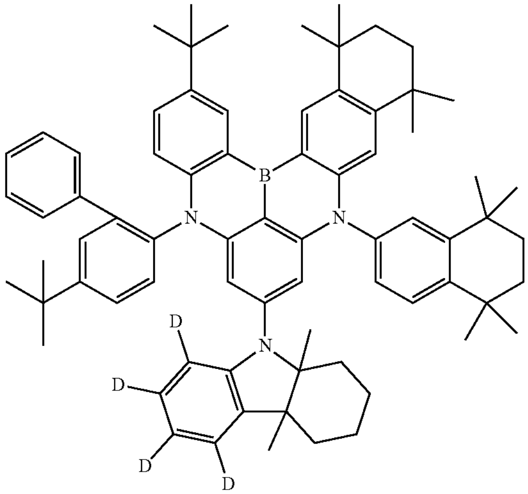
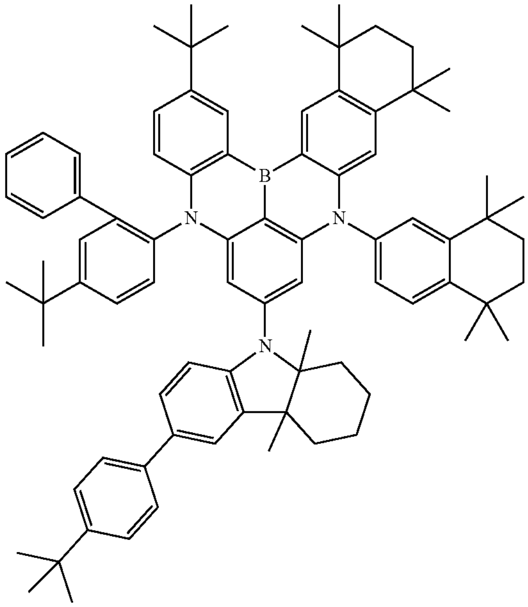

4099 | 4100
-continued
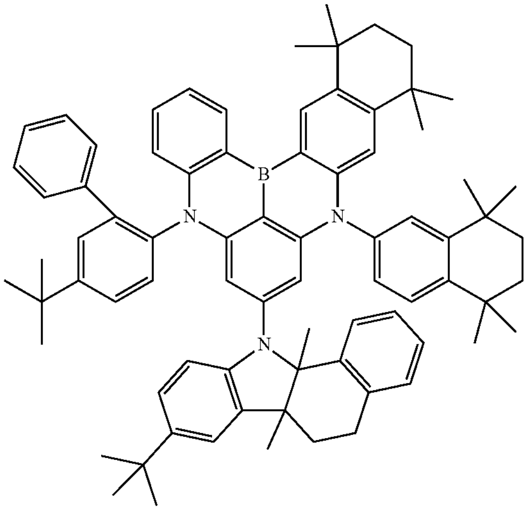
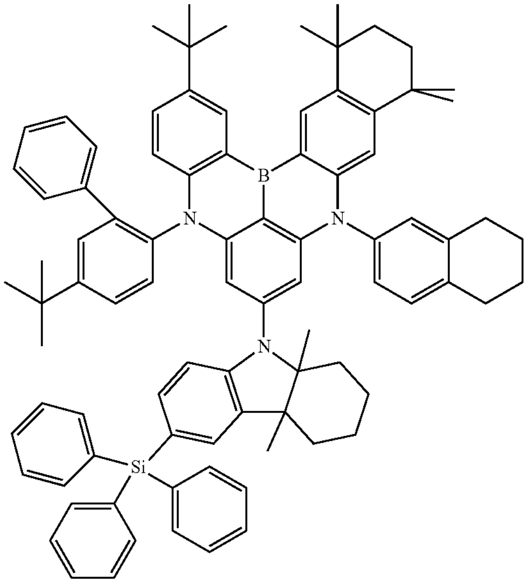
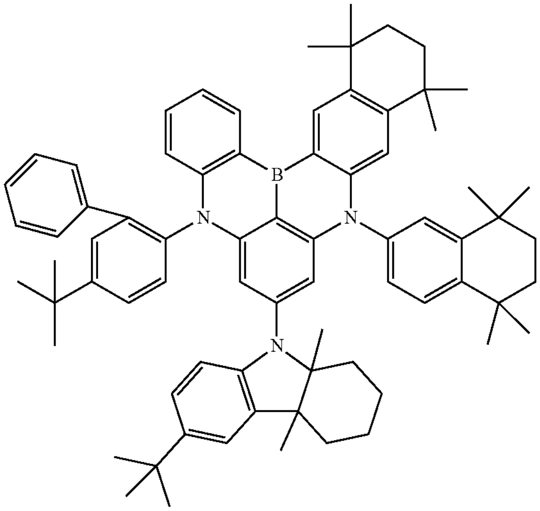
-continued
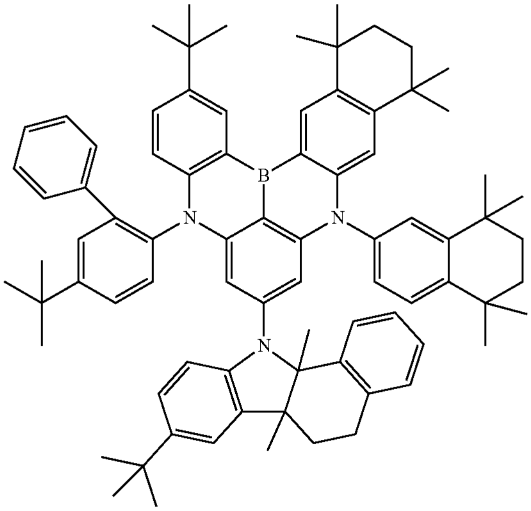
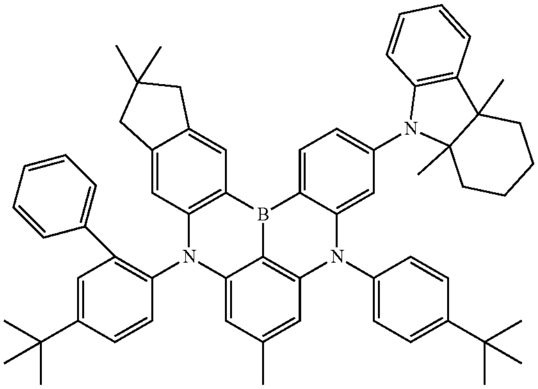
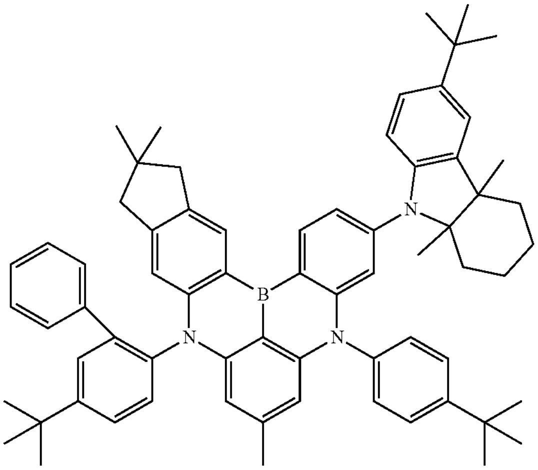

-continued
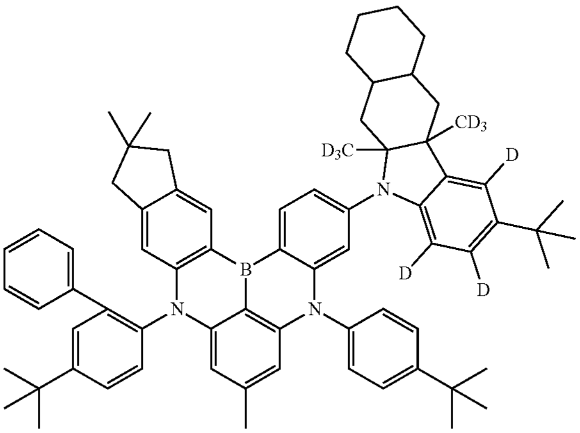
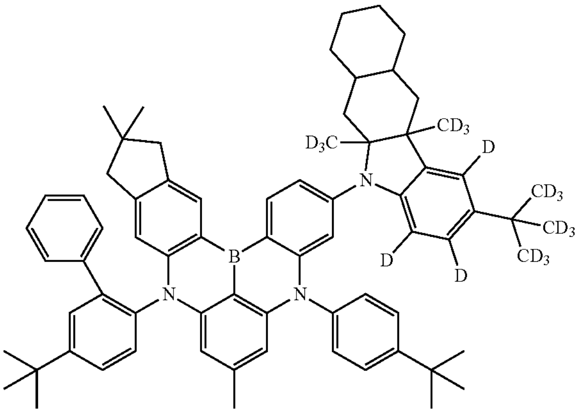
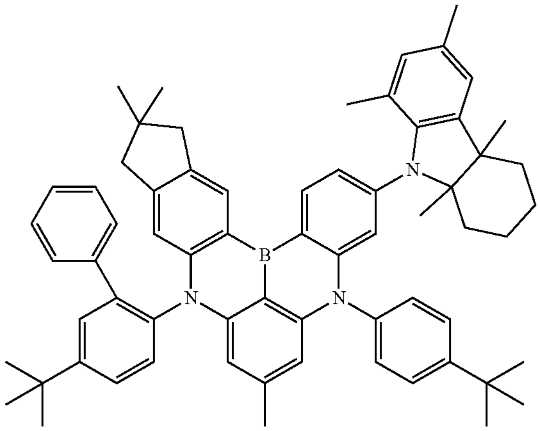
-continued
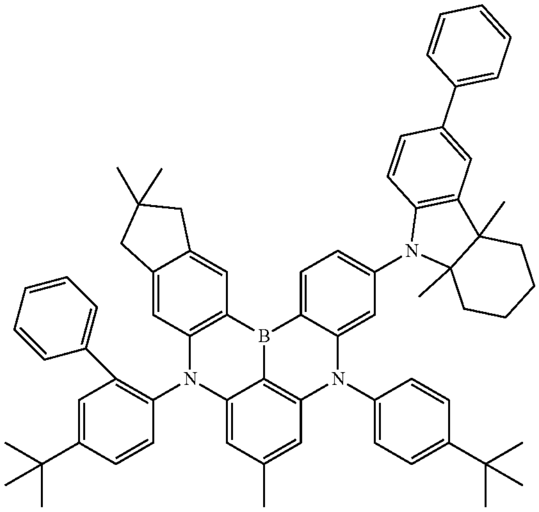
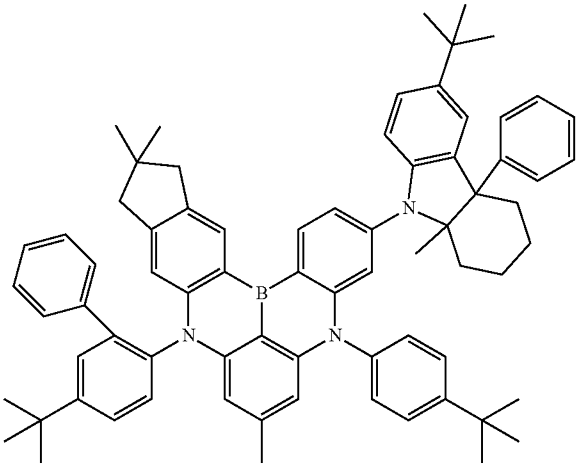
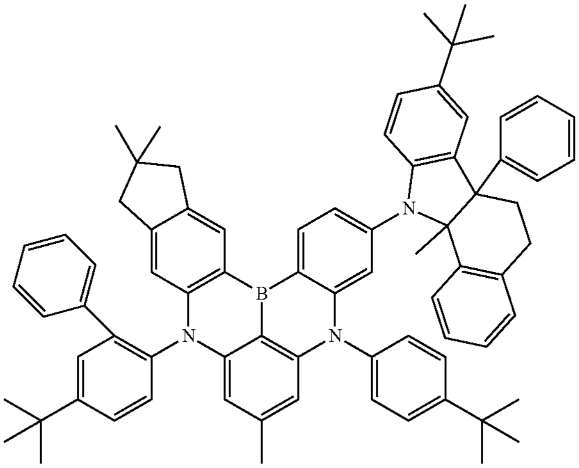

-continued
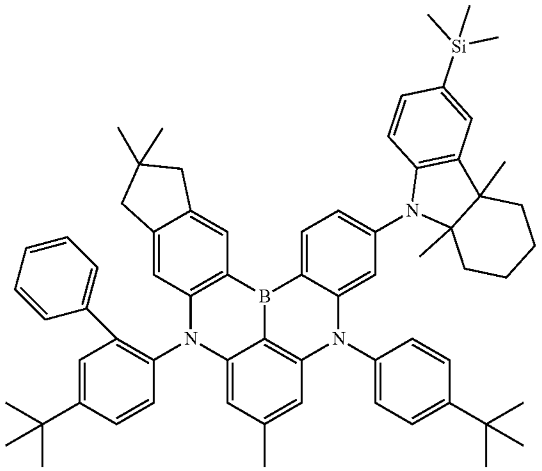
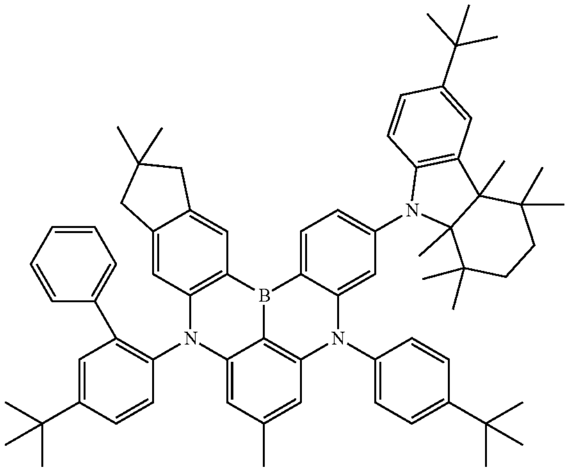
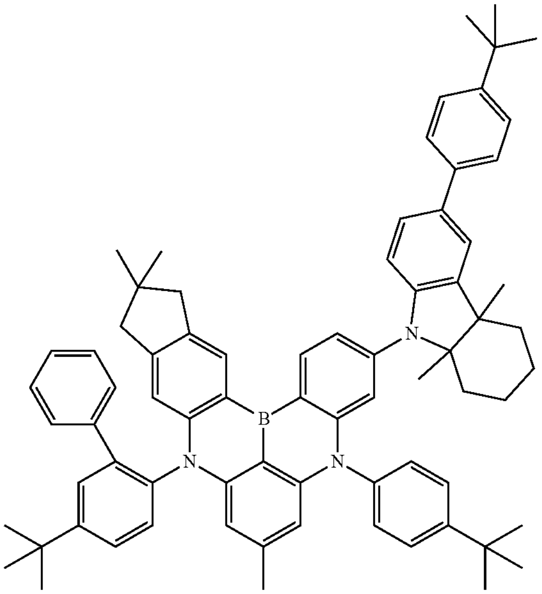
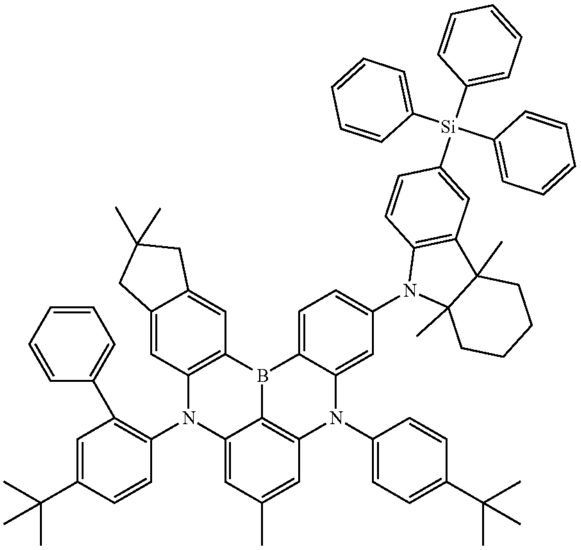
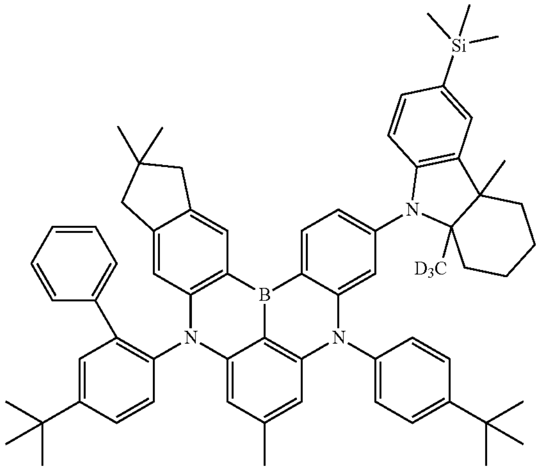
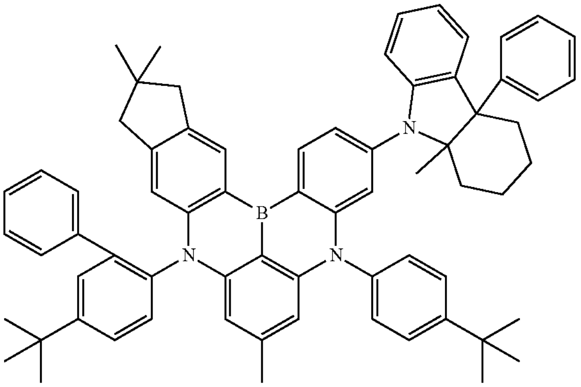
-continued -continued
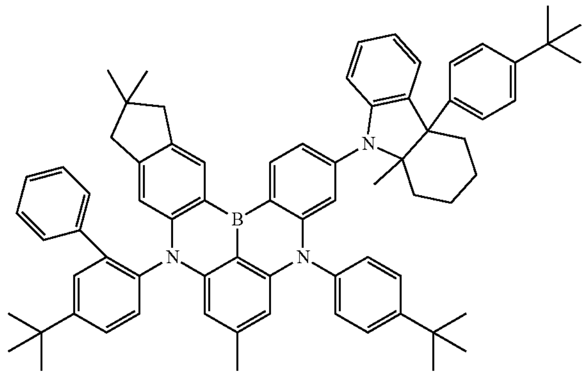
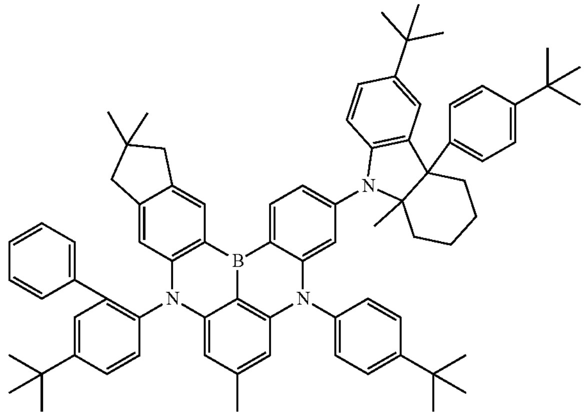
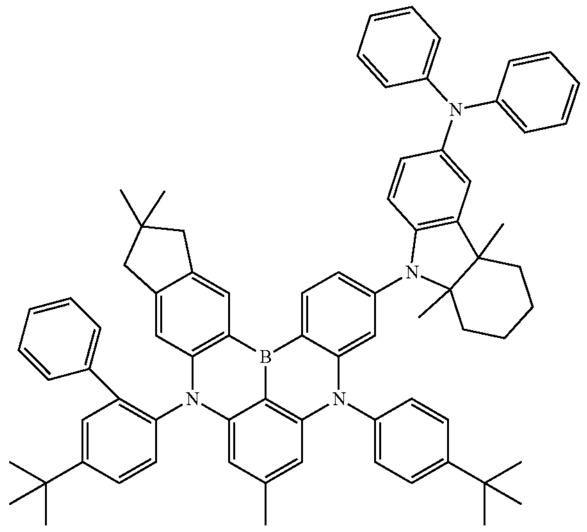
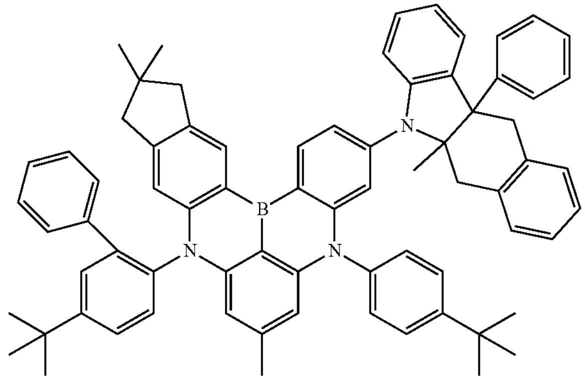
-continued
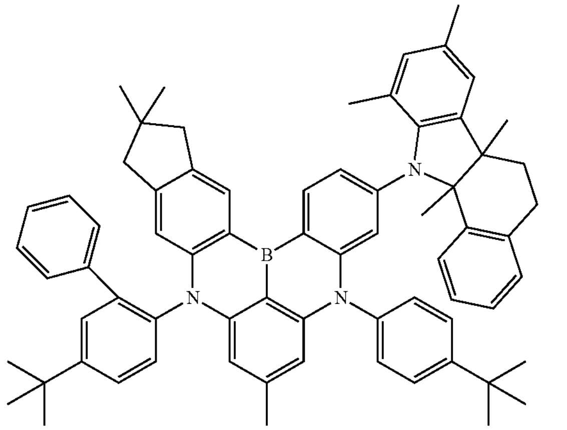
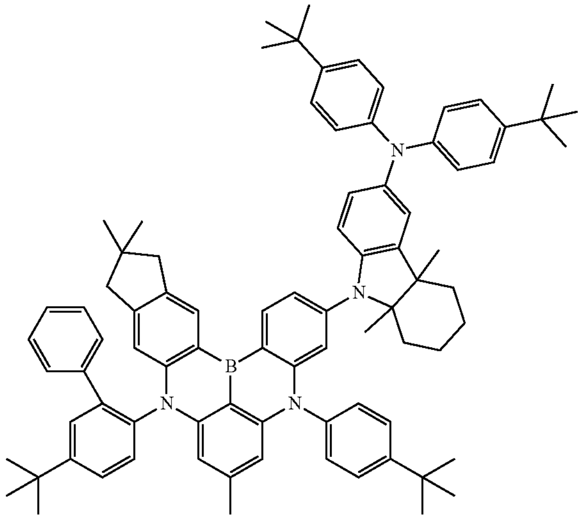
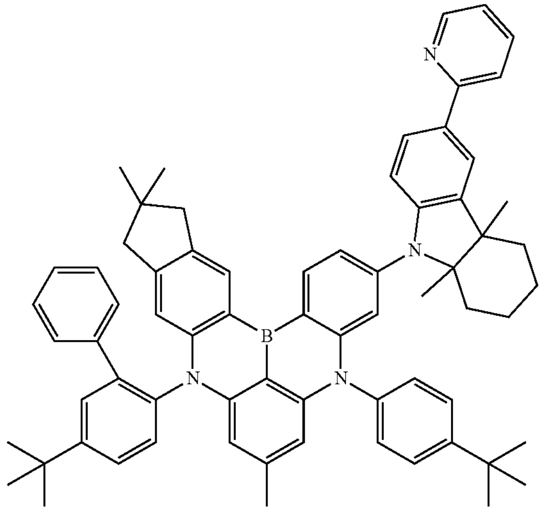

-continued
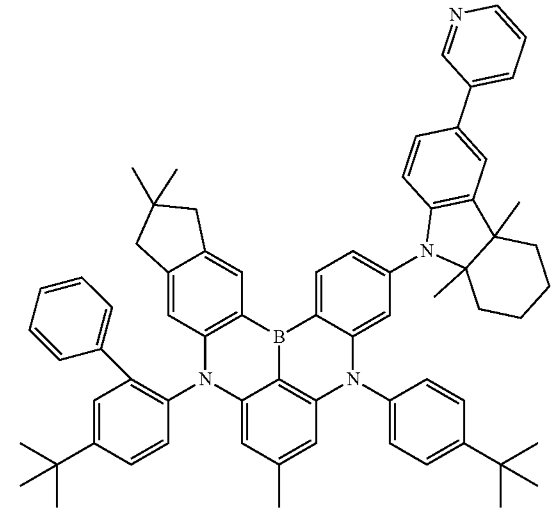
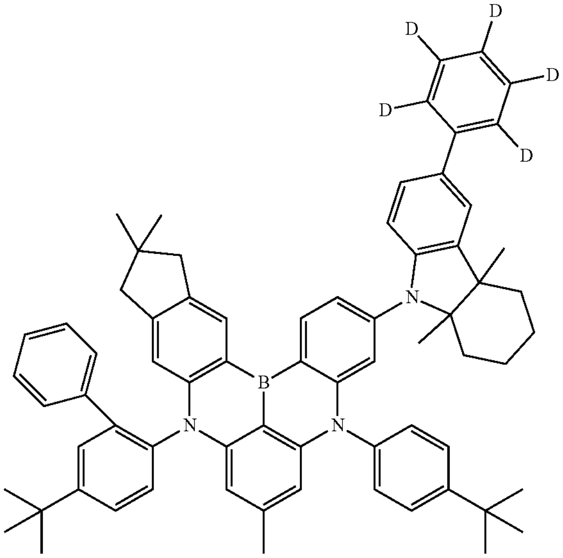
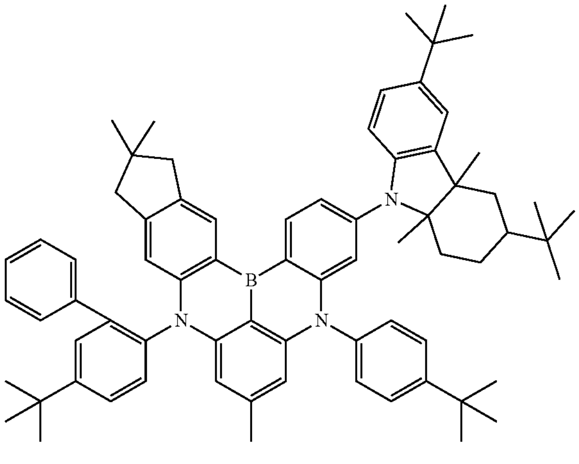
-continued
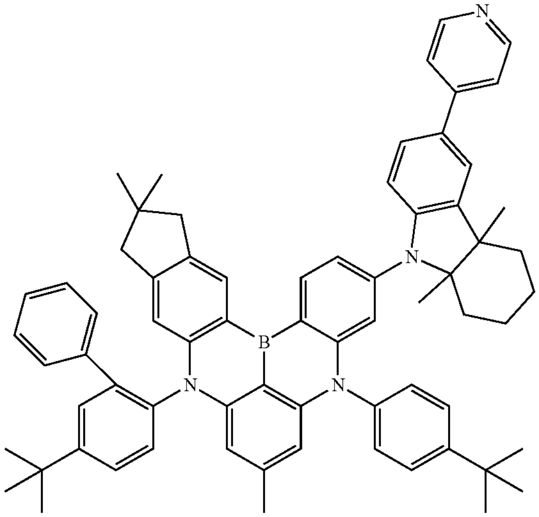
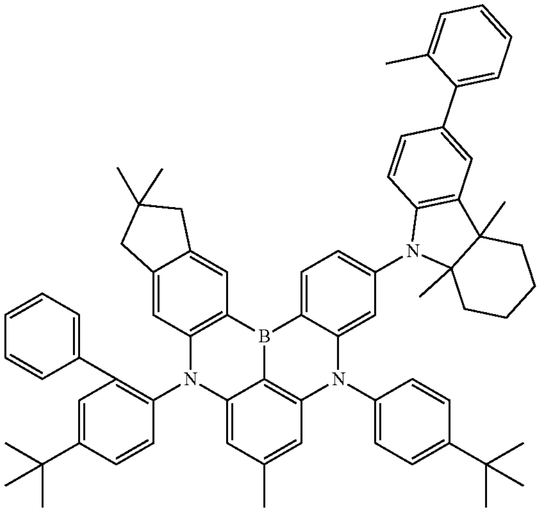
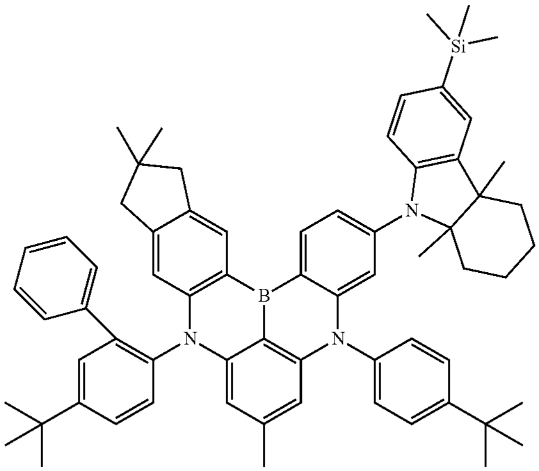

-continued
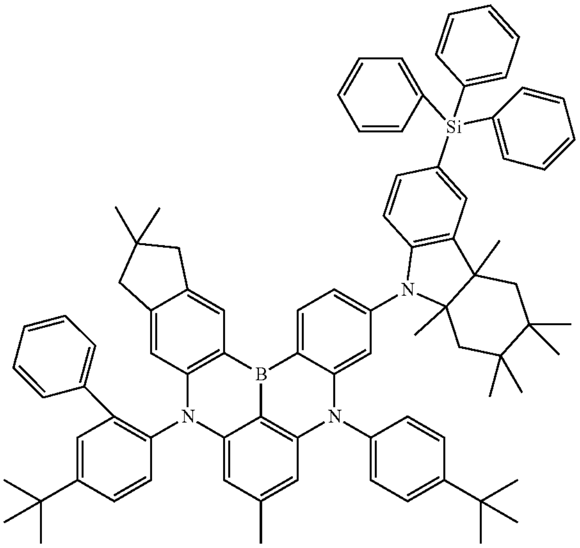
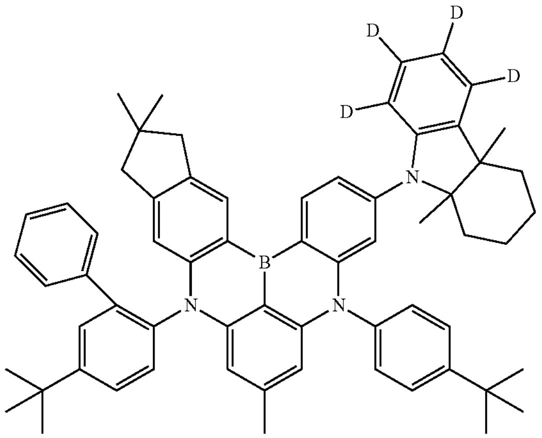
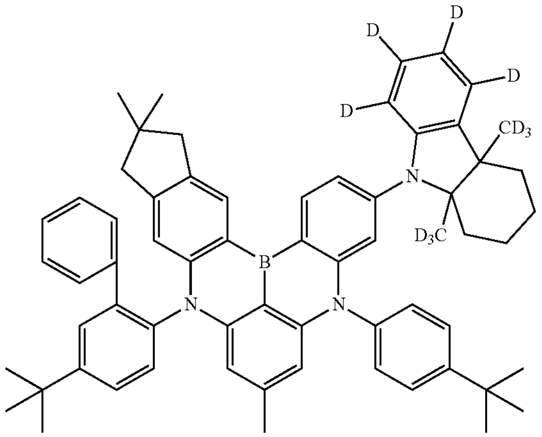
-continued
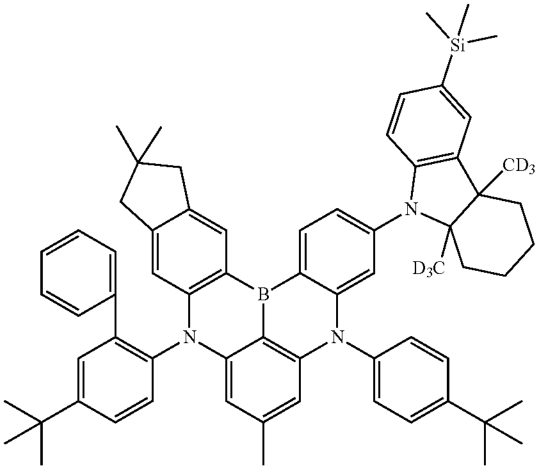
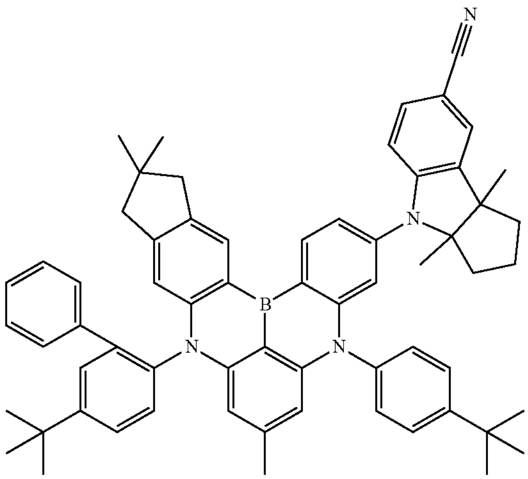
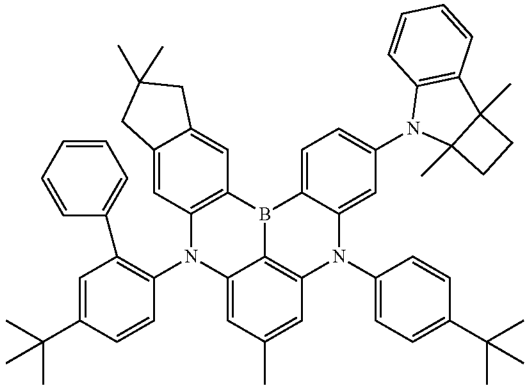
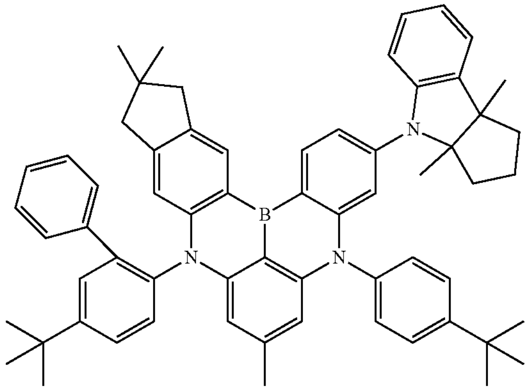

-continued
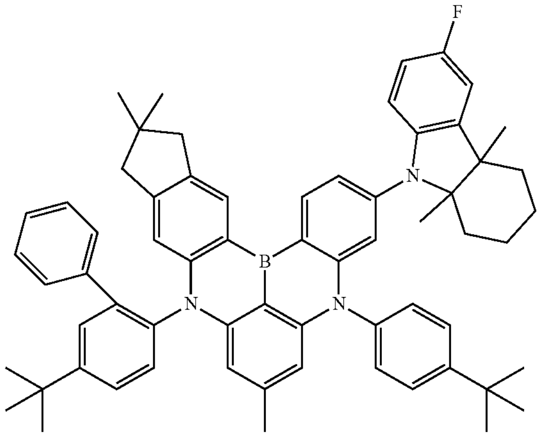
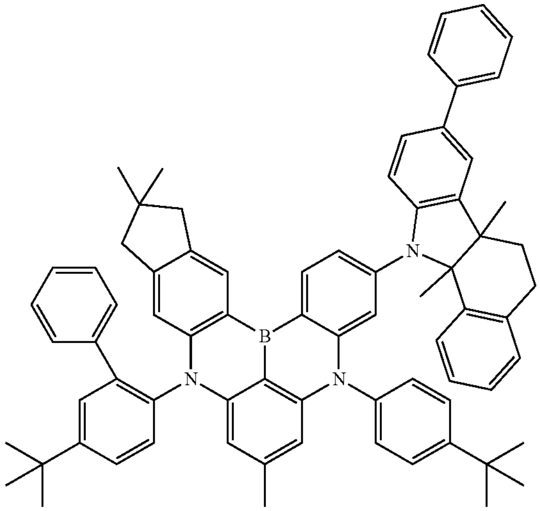
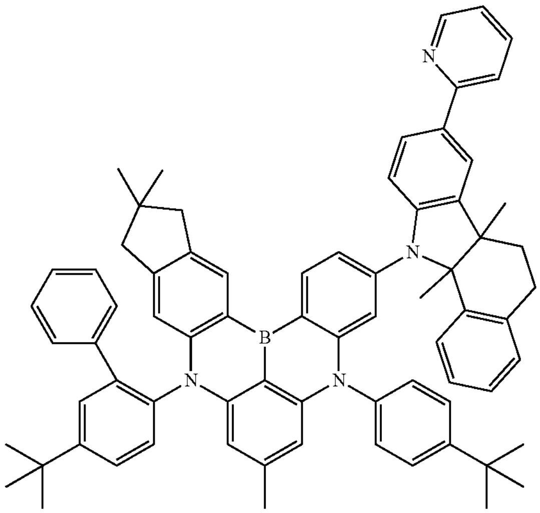
-continued
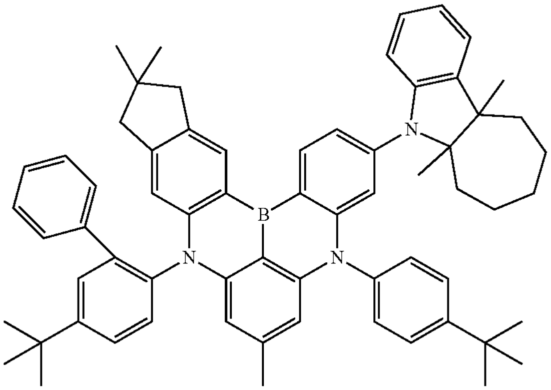
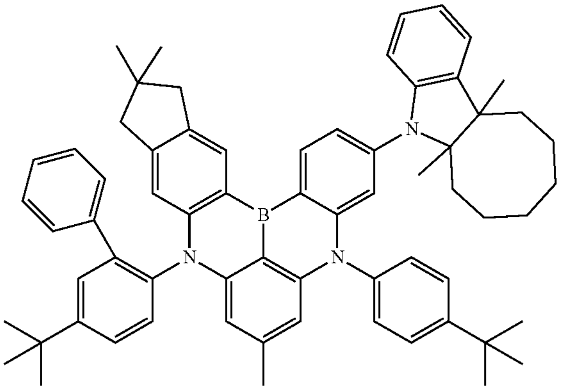
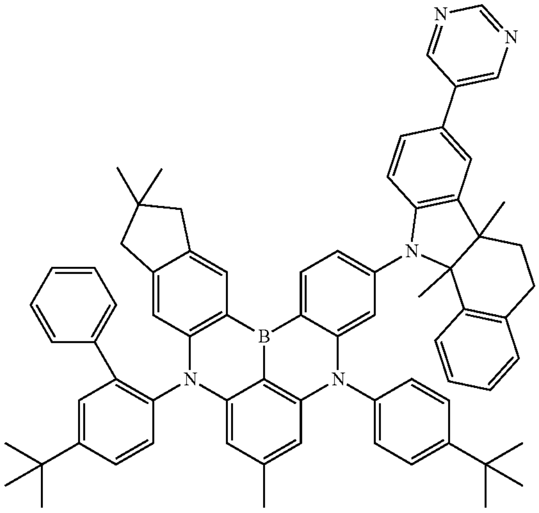

-continued
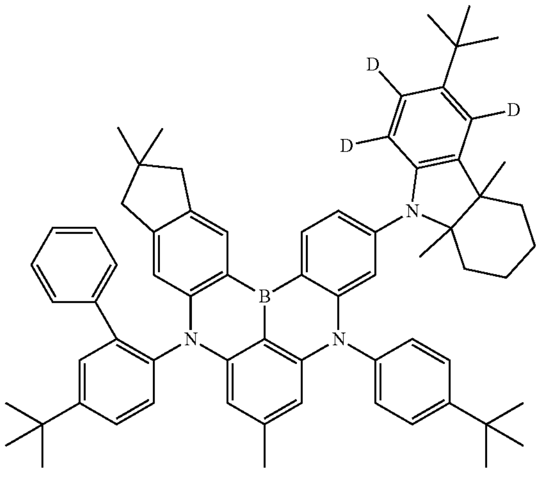
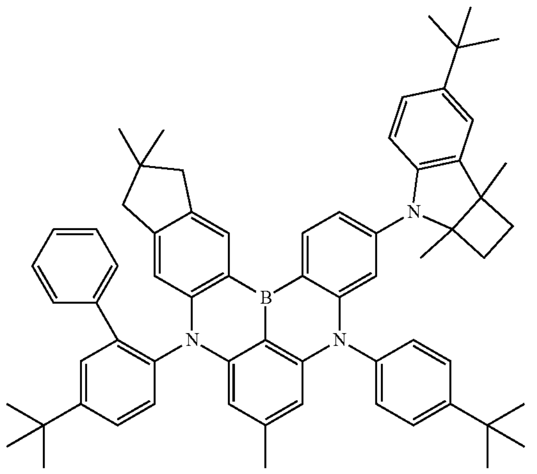
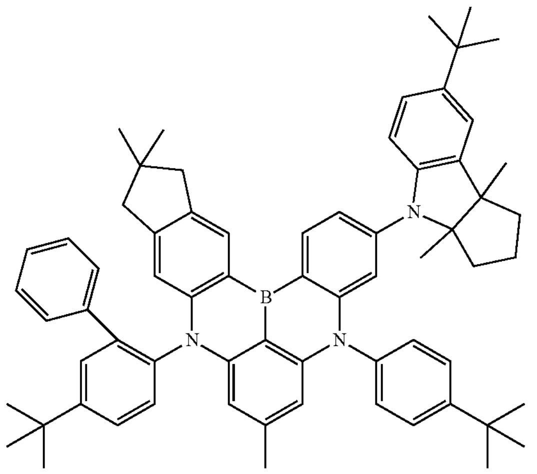
-continued
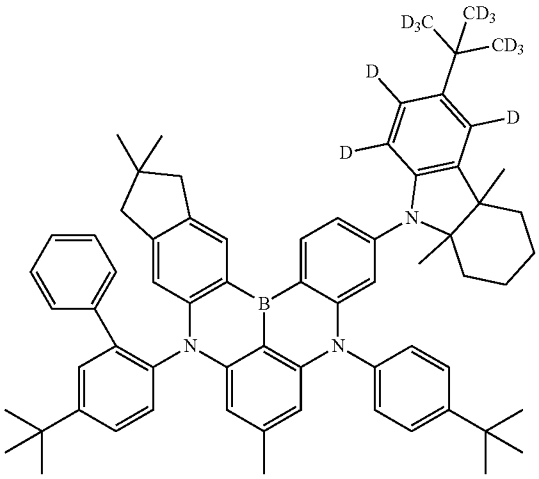
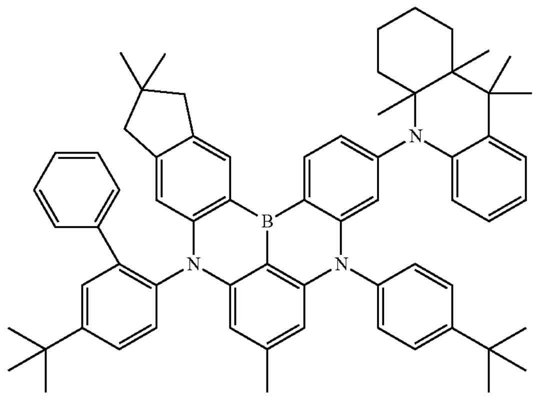
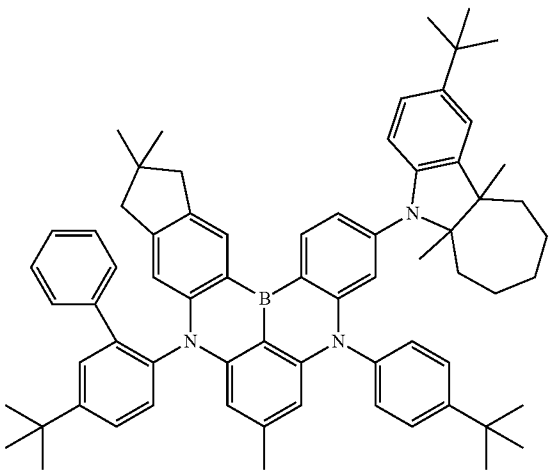

-continued
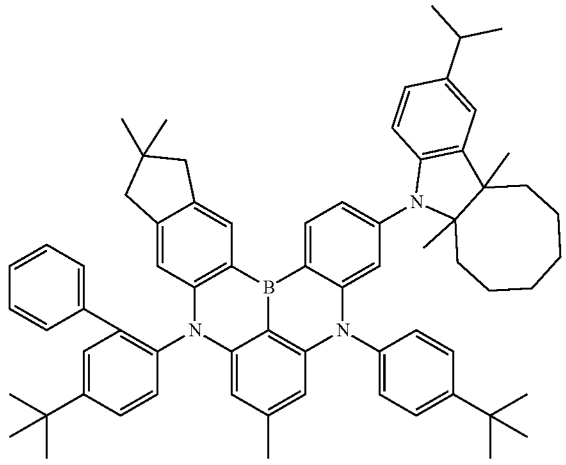
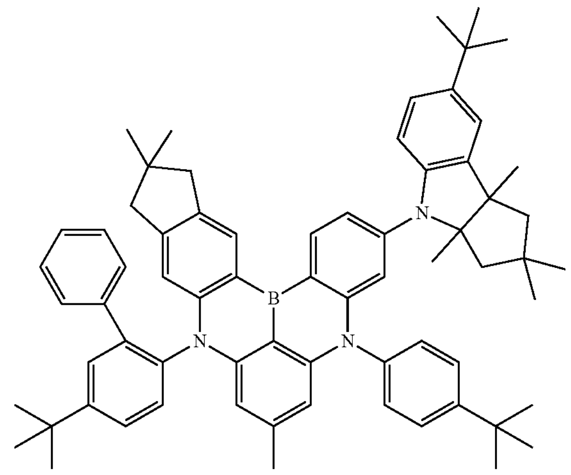
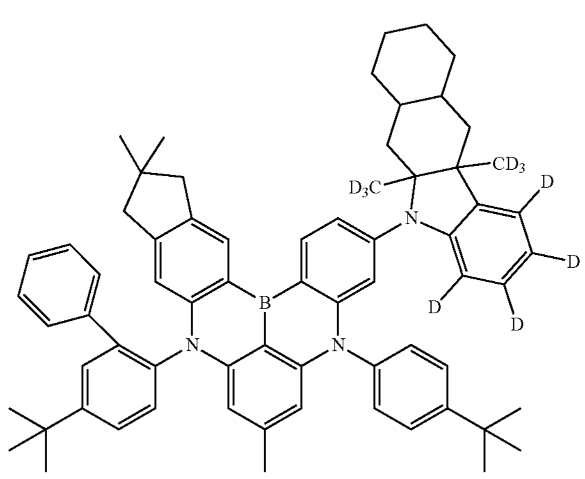
-continued
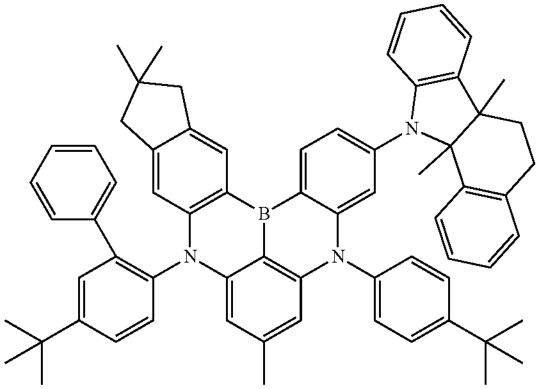
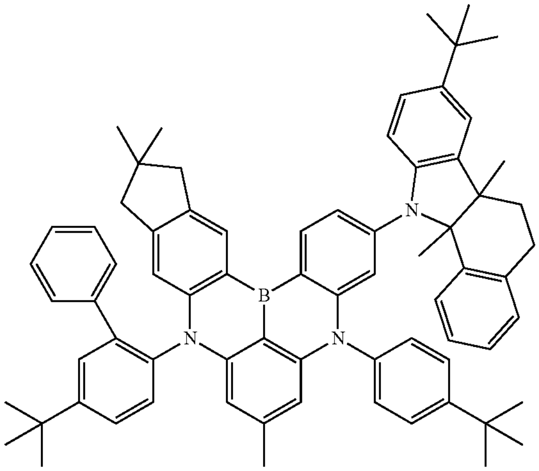
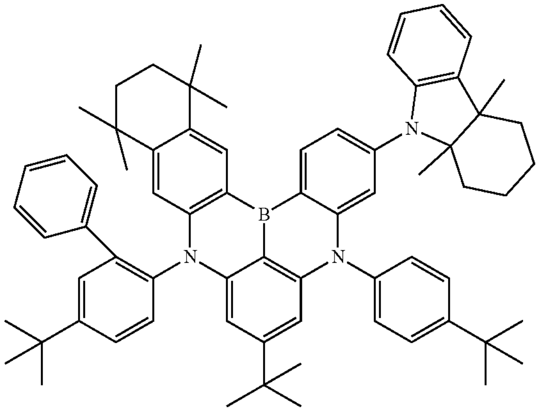

-continued
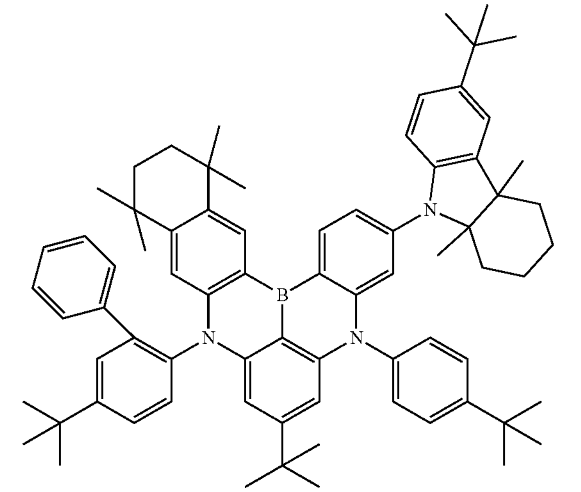
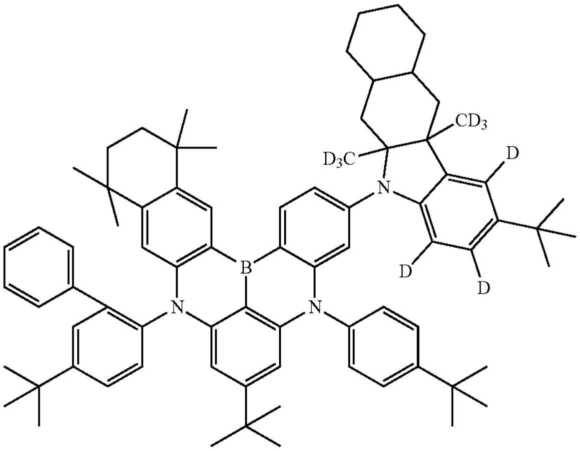
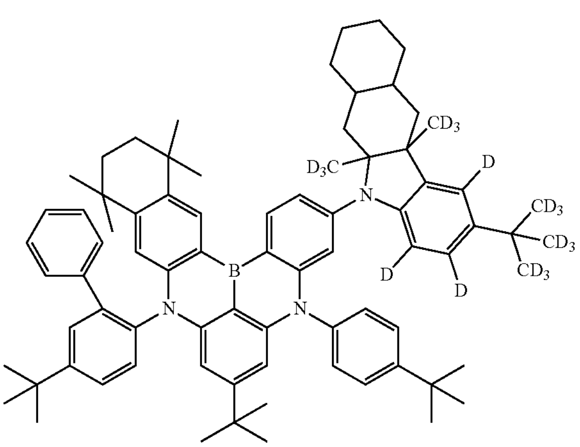
-continued
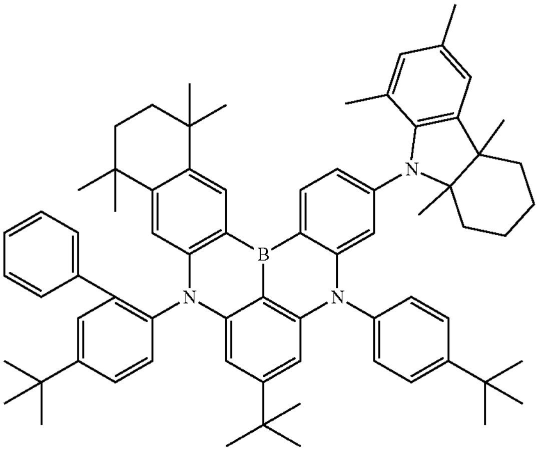
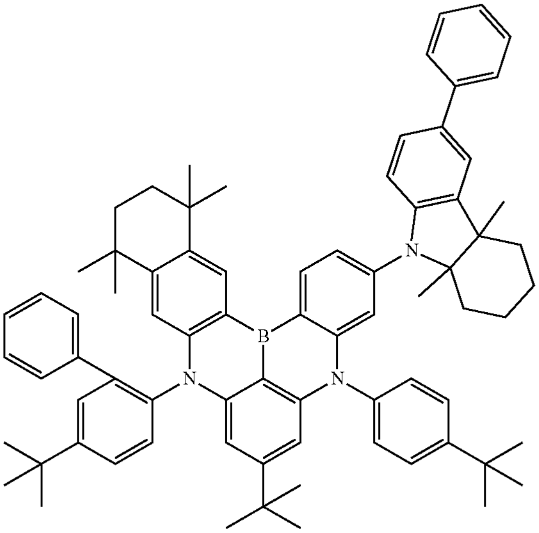
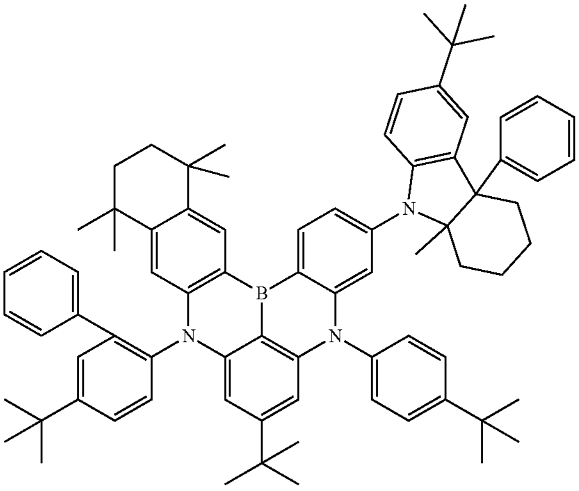

-continued
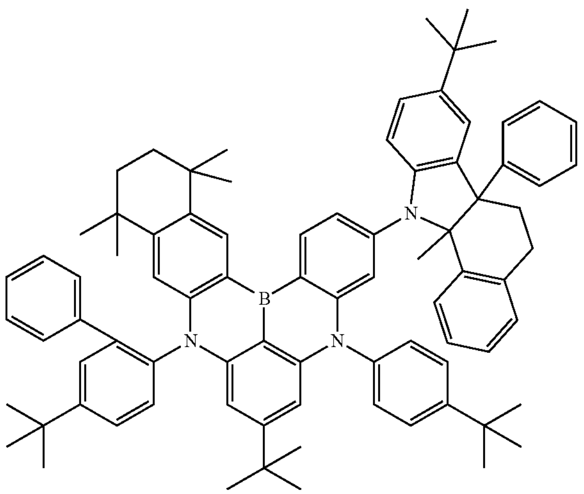
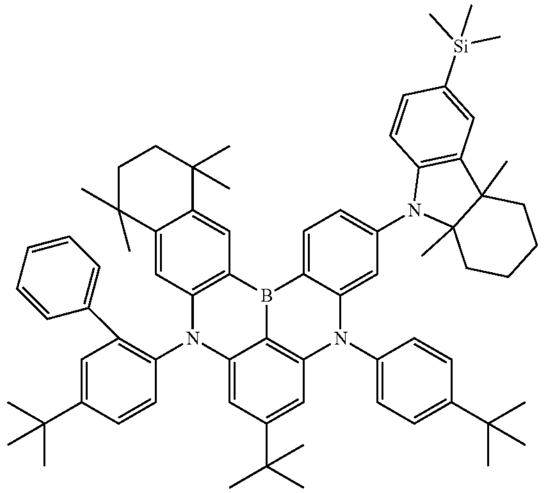
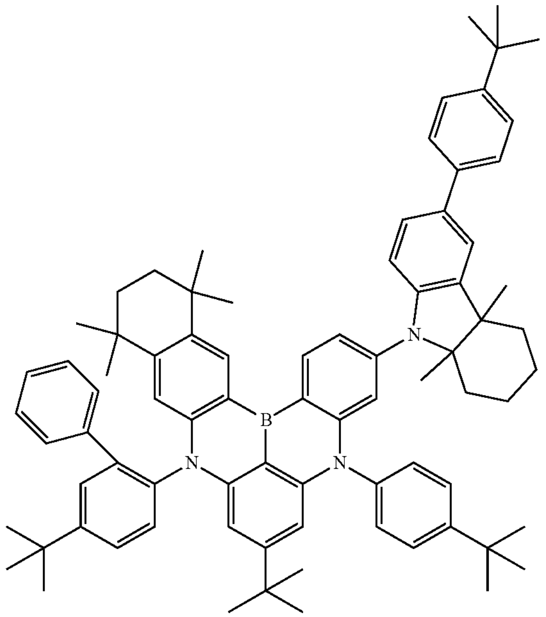
-continued
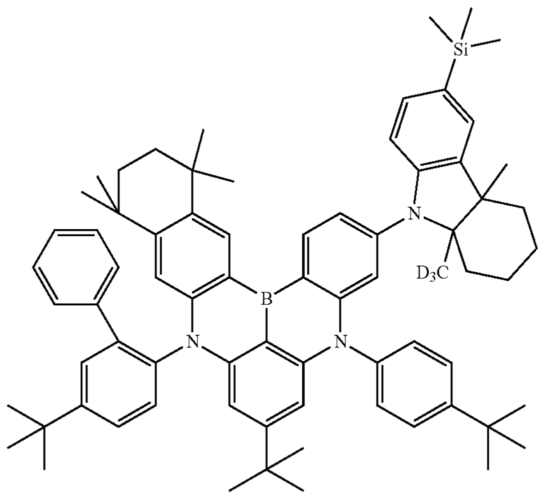
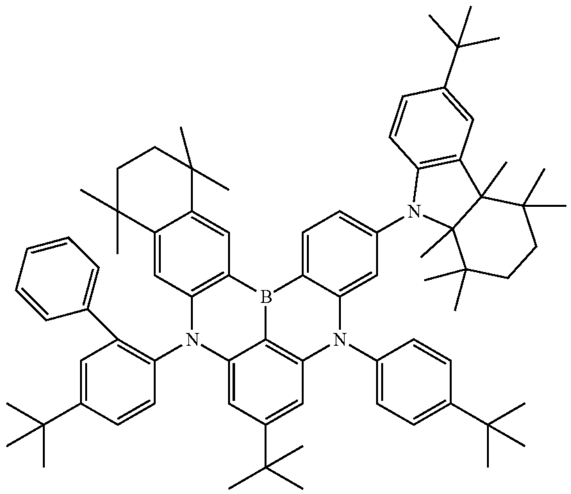
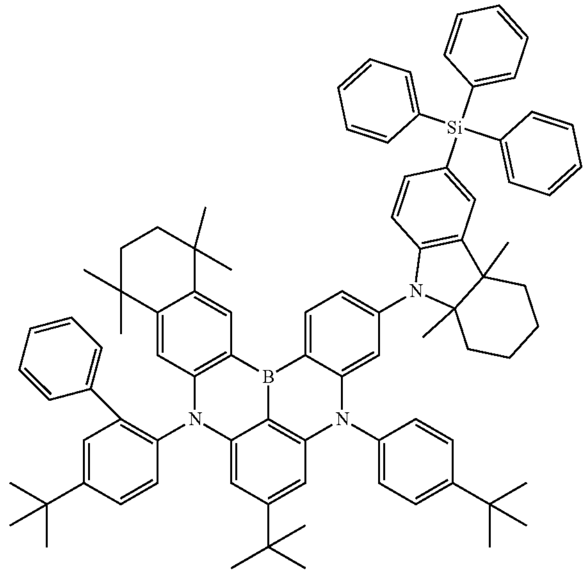

-continued
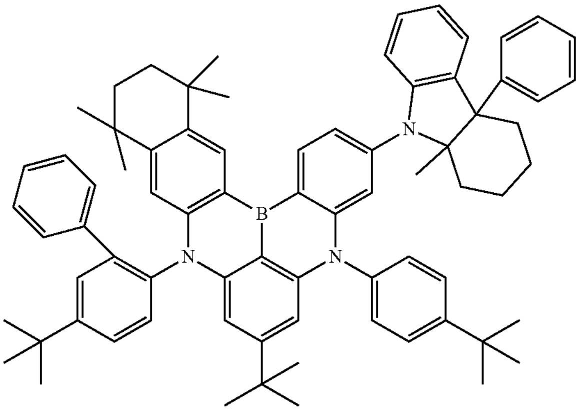
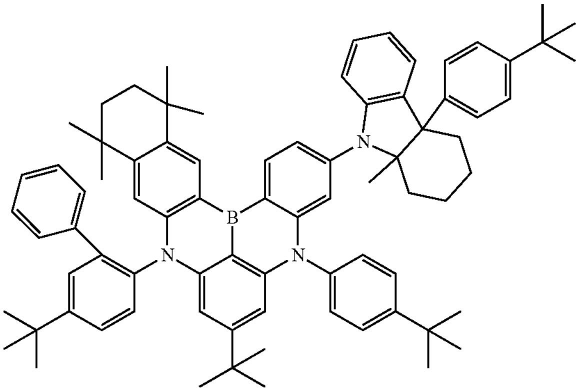
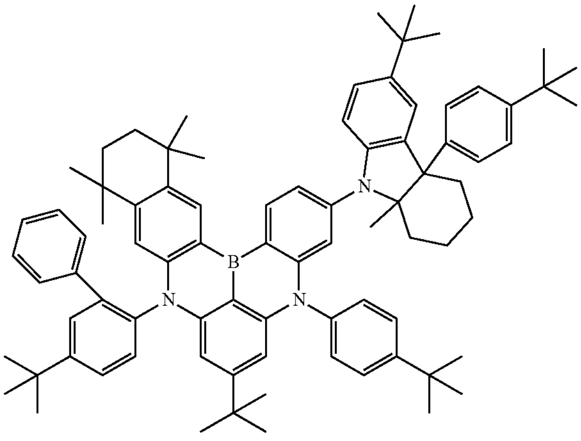
-continued
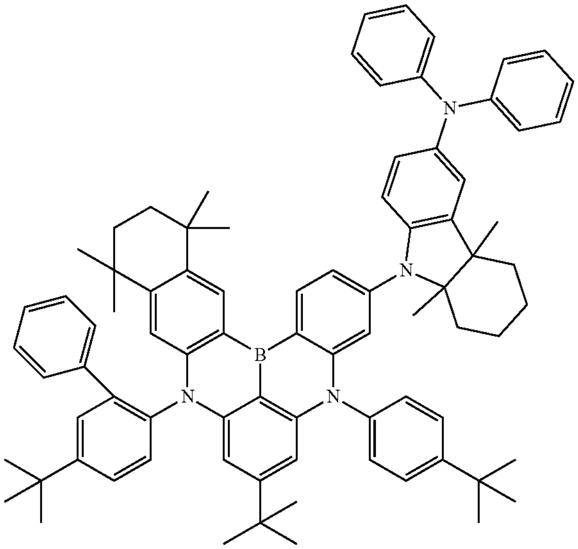
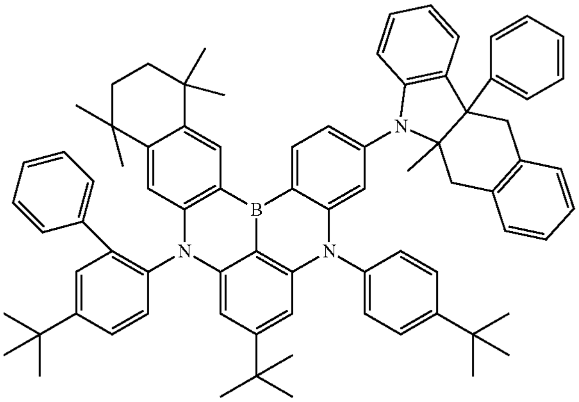
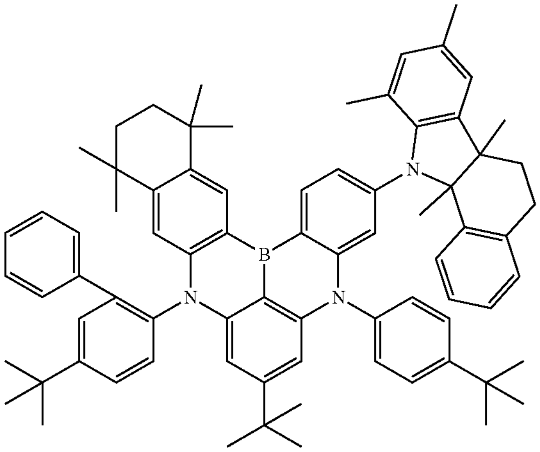

-continued
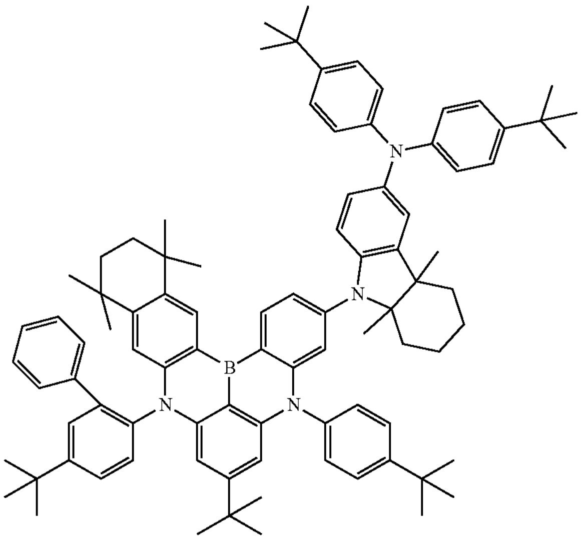
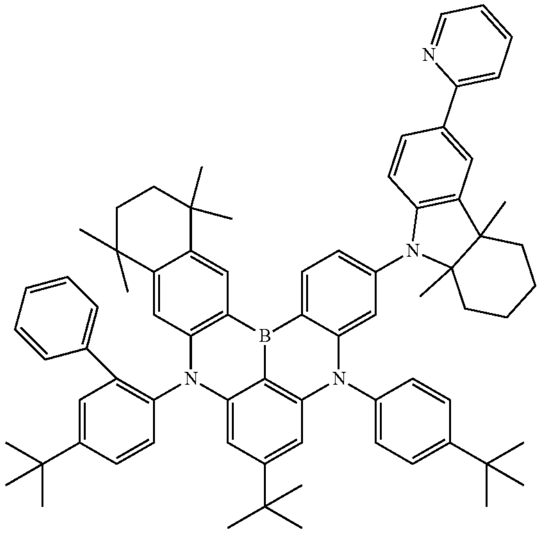
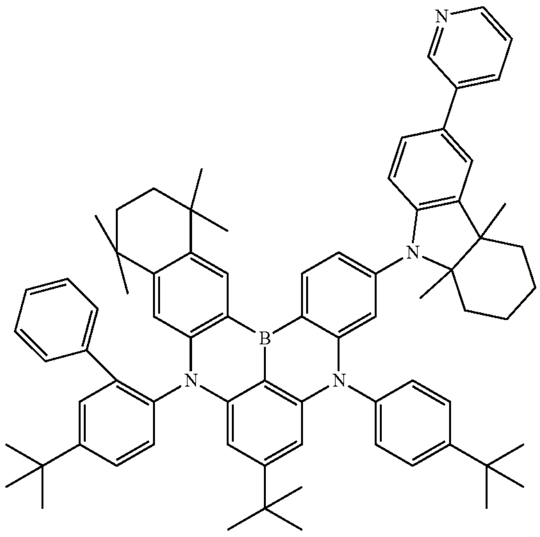
-continued
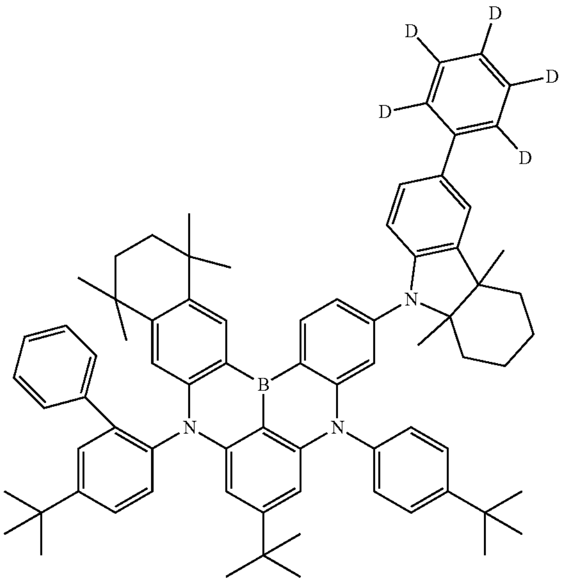
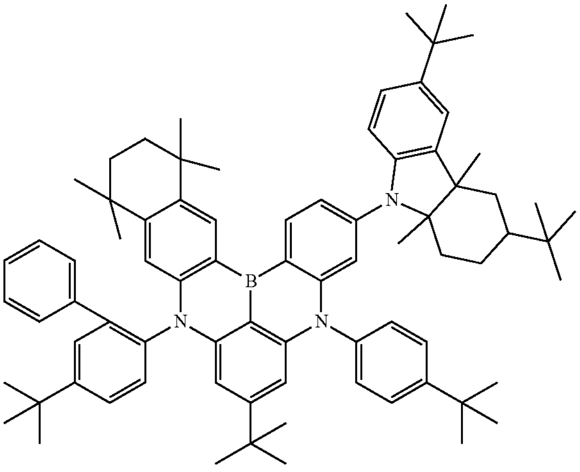
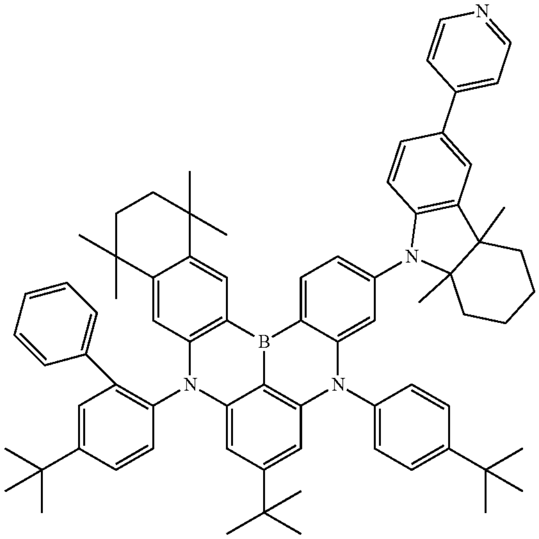

-continued
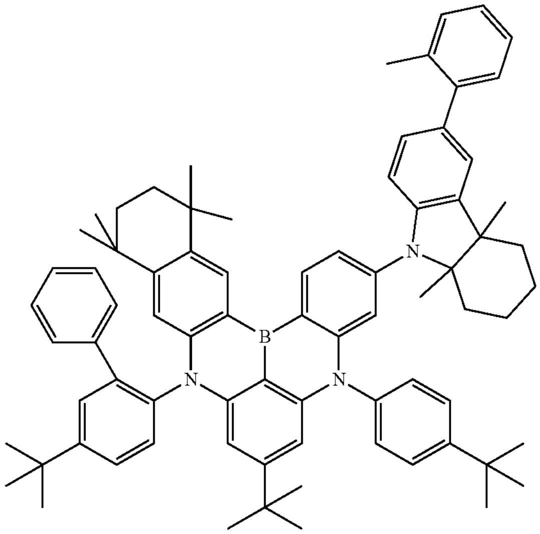
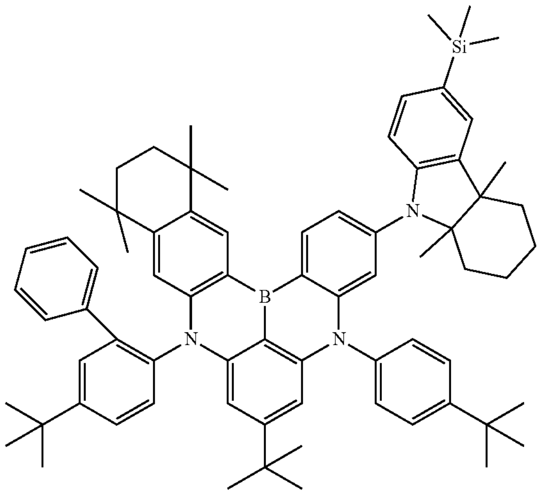
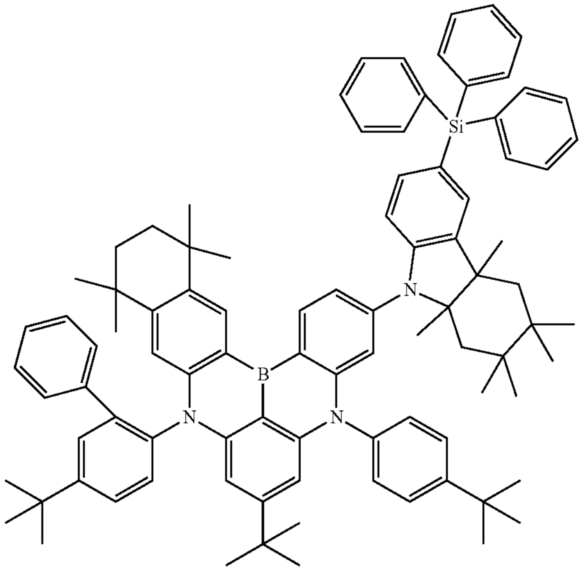
-continued
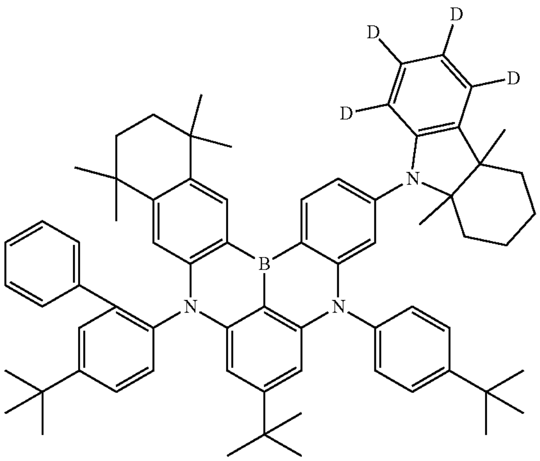
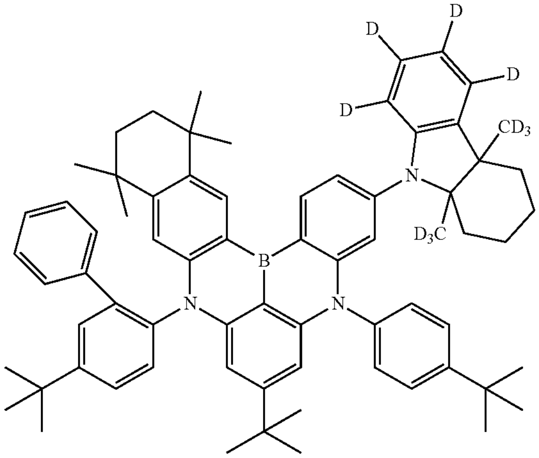
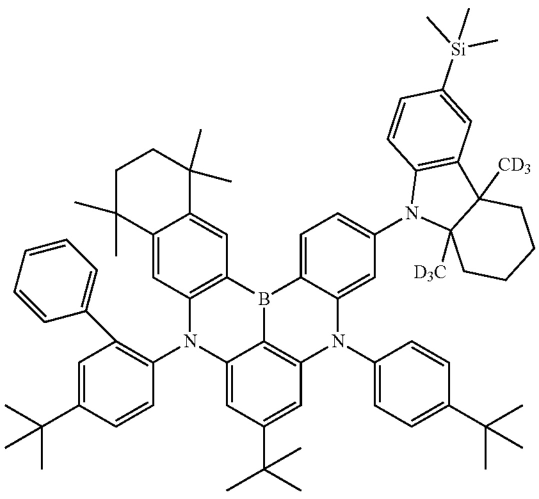

-continued
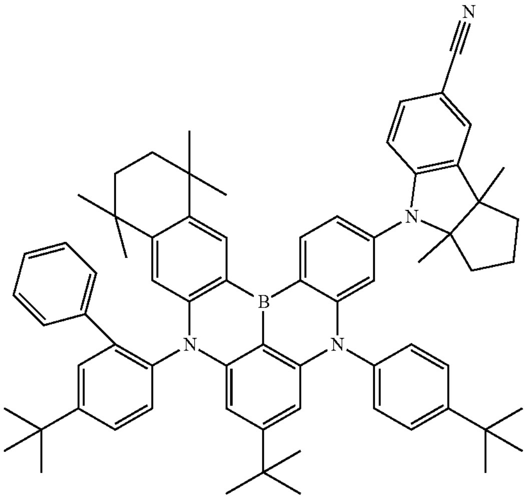
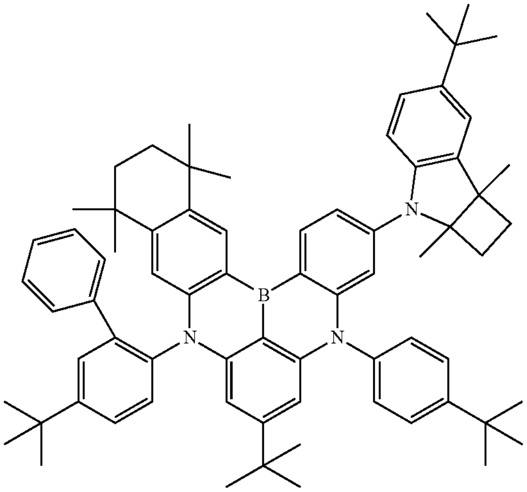
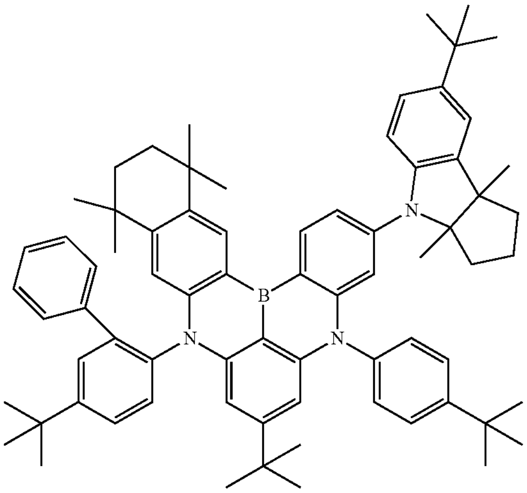
-continued
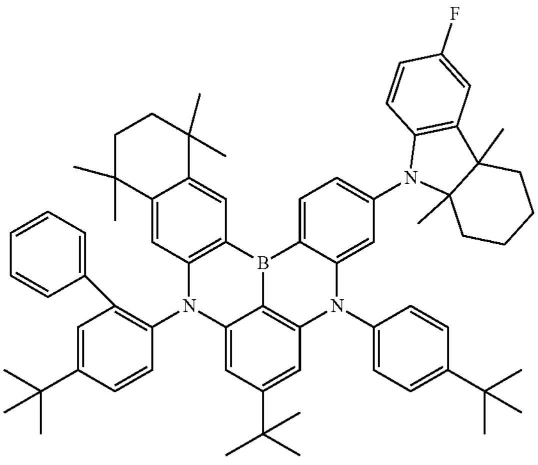
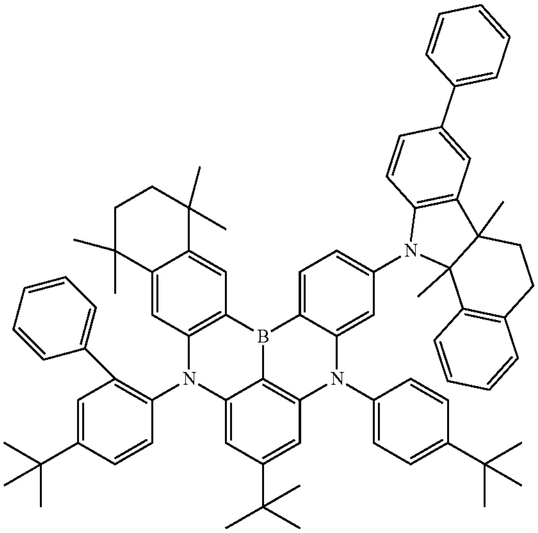
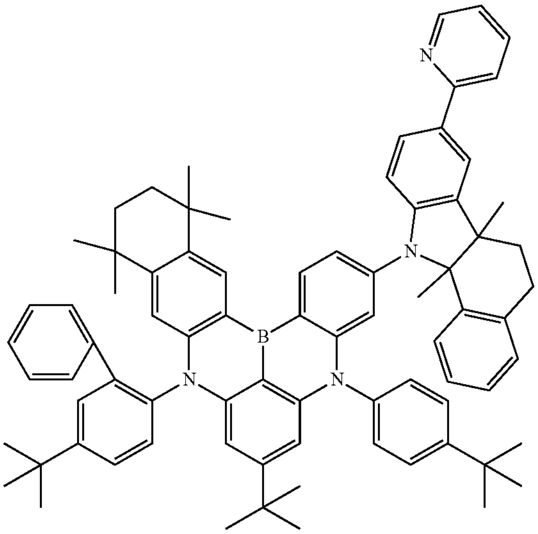

-continued
-continued
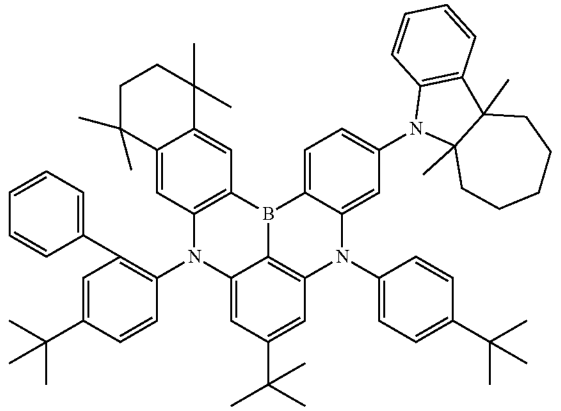
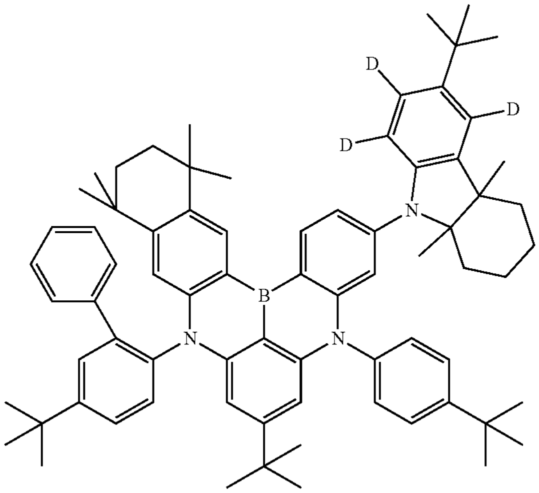
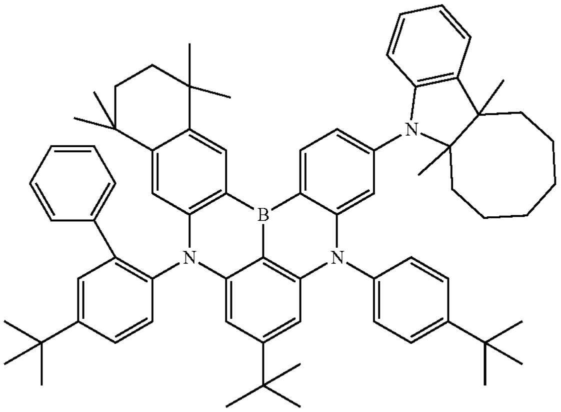
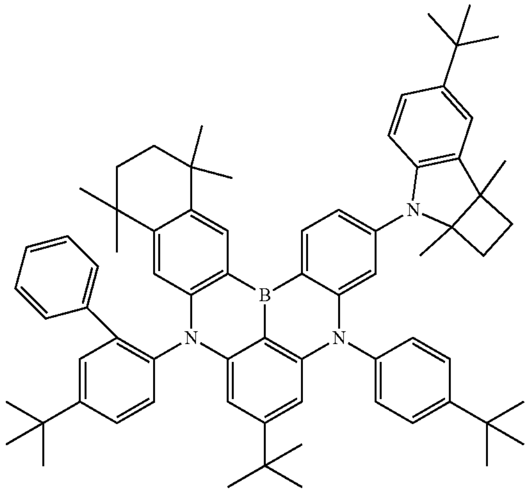
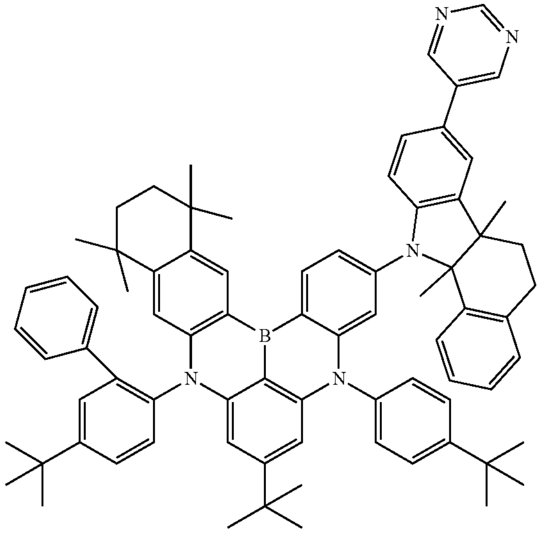
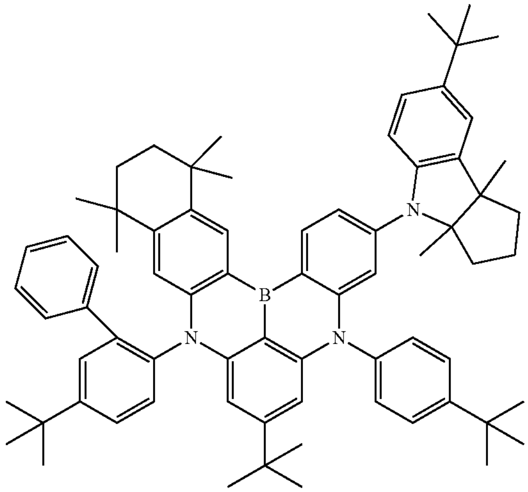

-continued
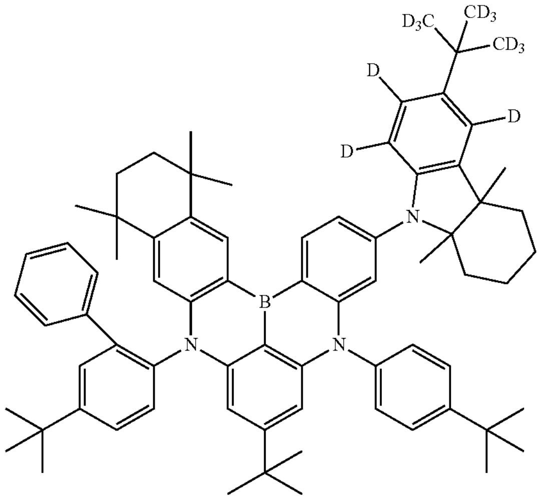
-continued
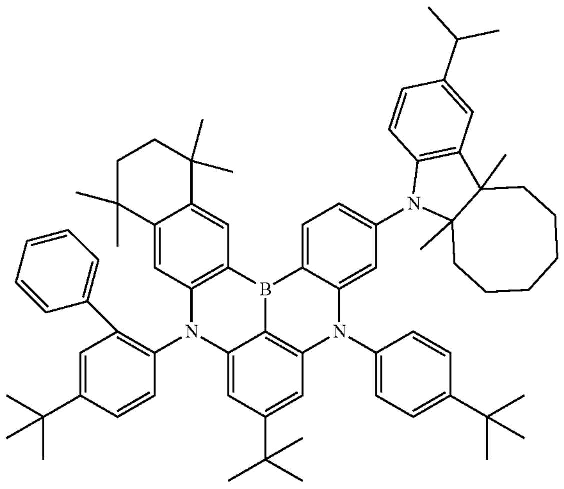
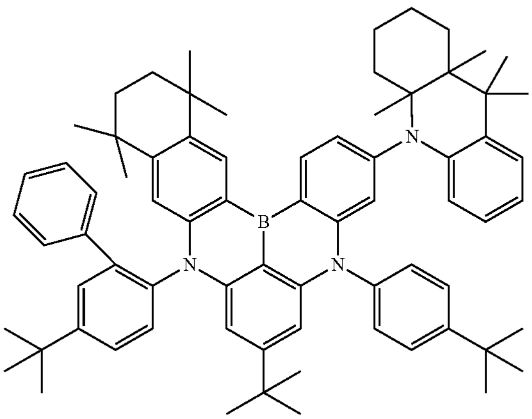
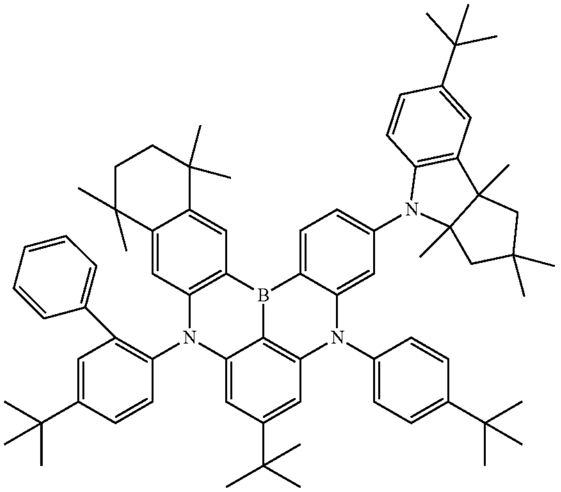
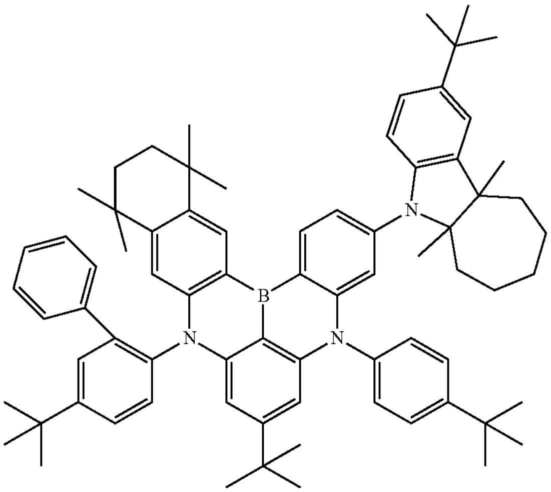
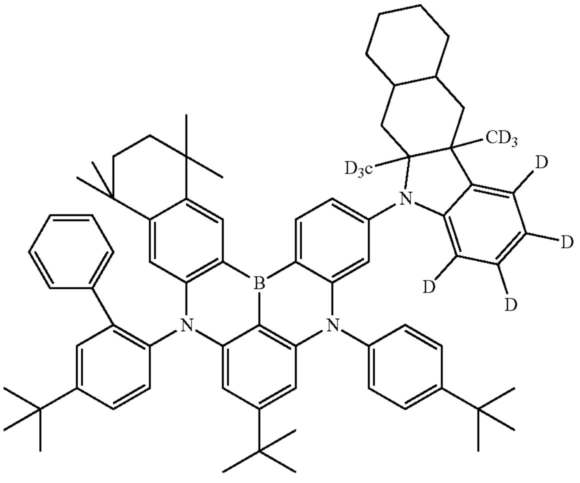

-continued
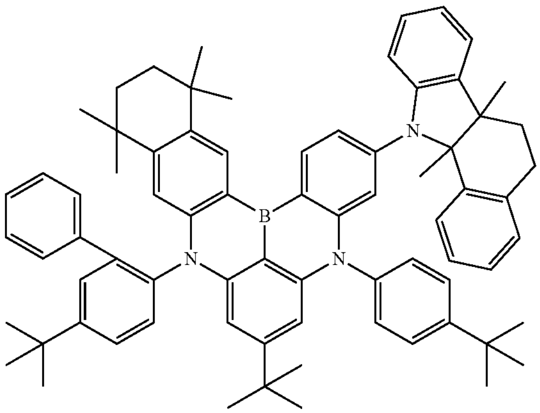
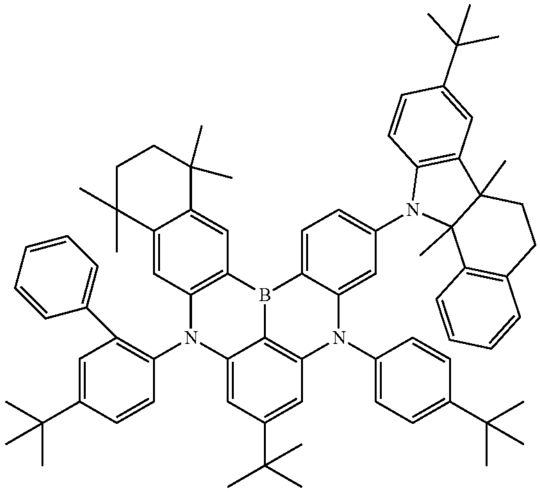
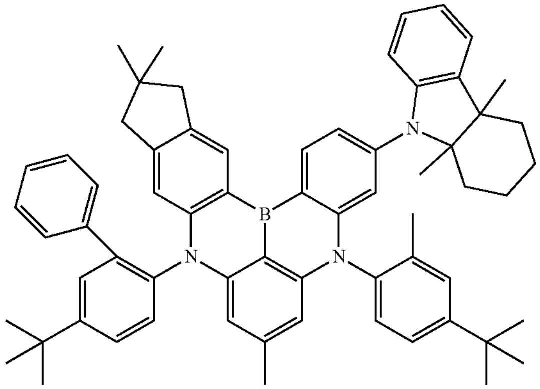
-continued
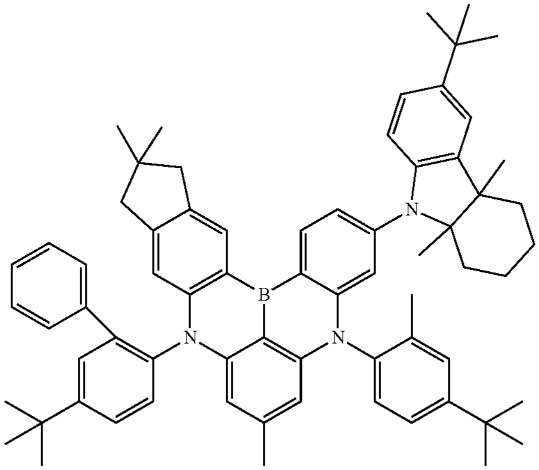
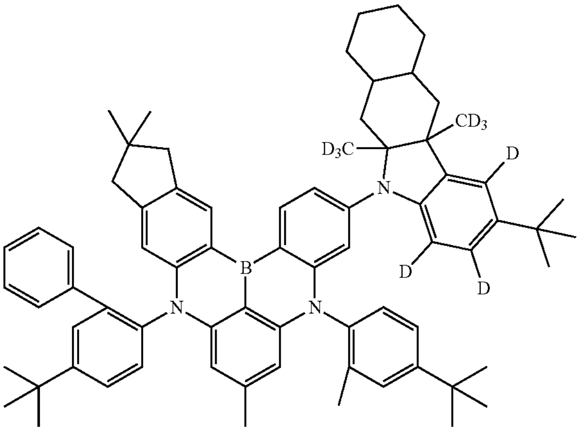
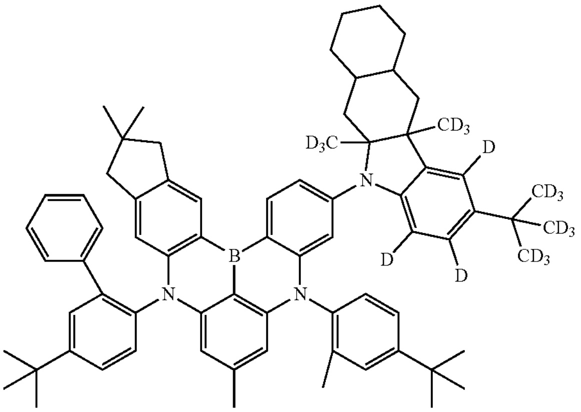

-continued
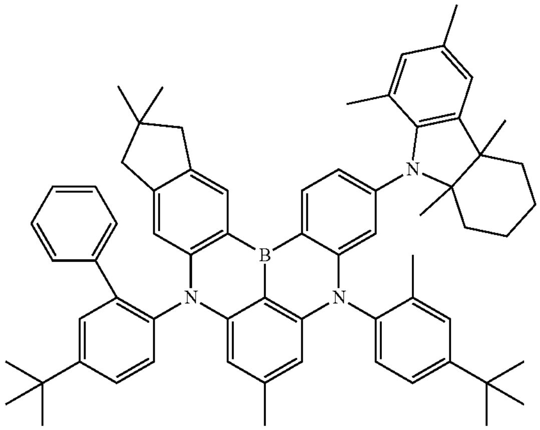
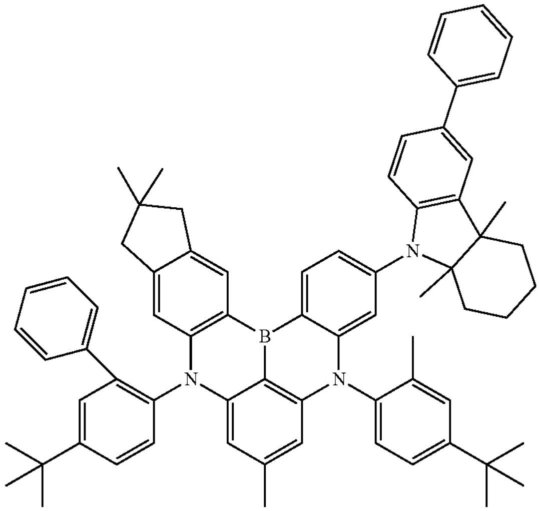
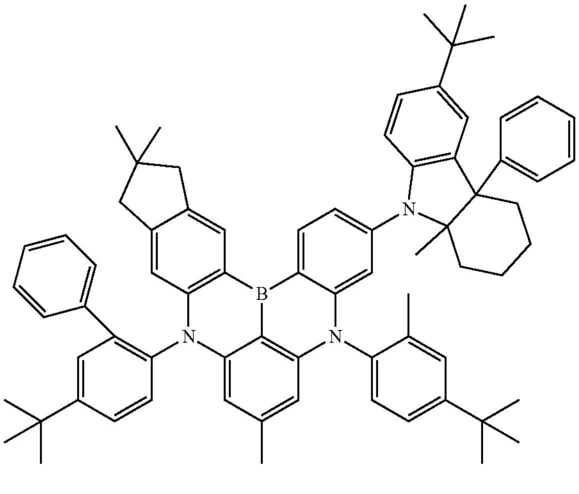
-continued
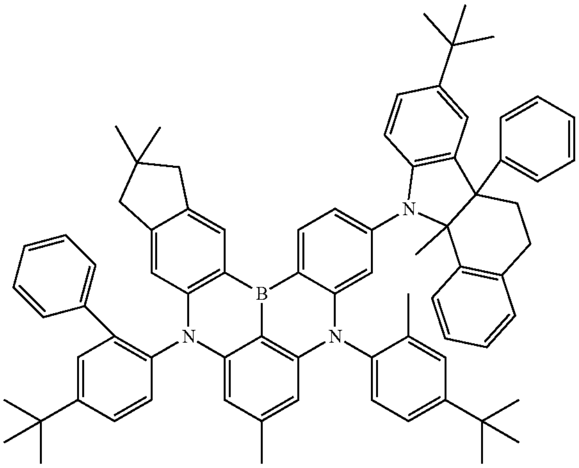
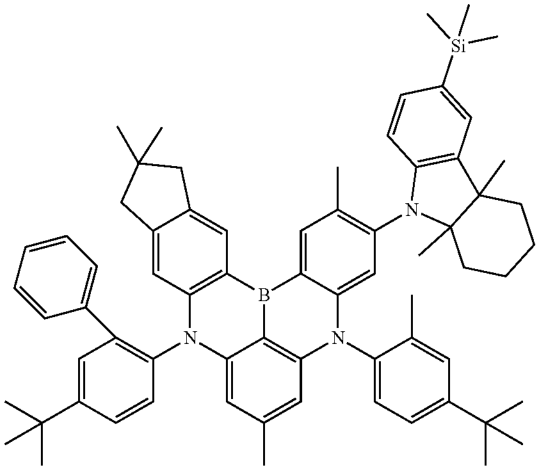
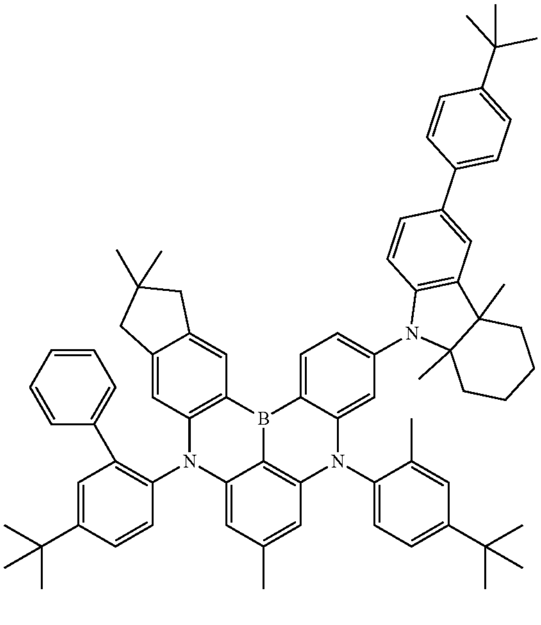

-continued
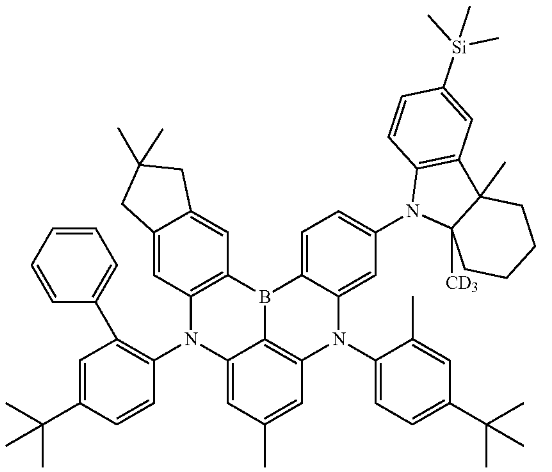
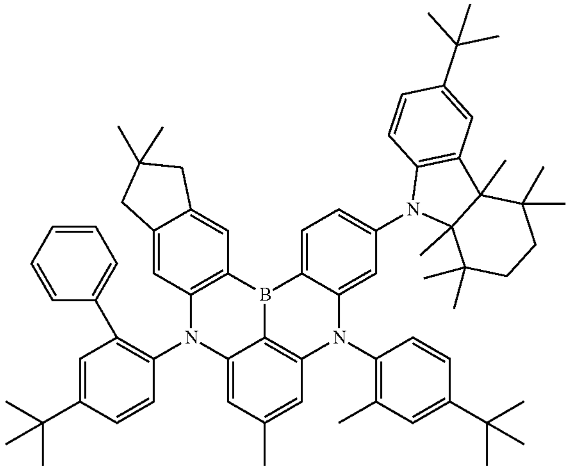
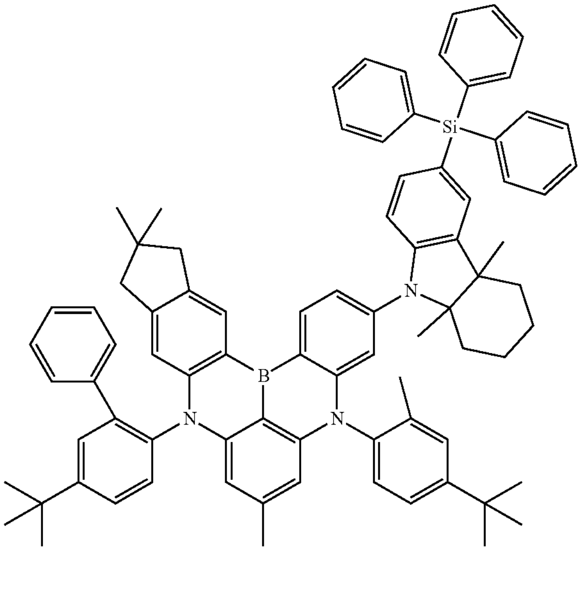
-continued
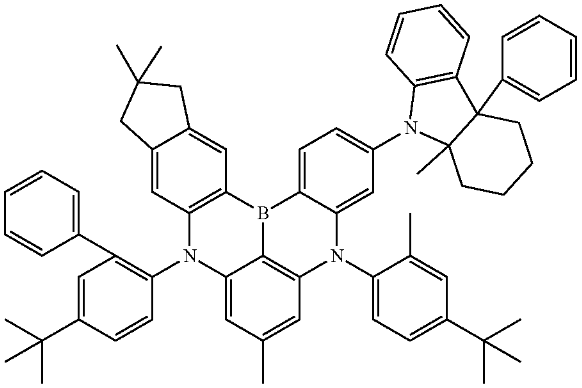
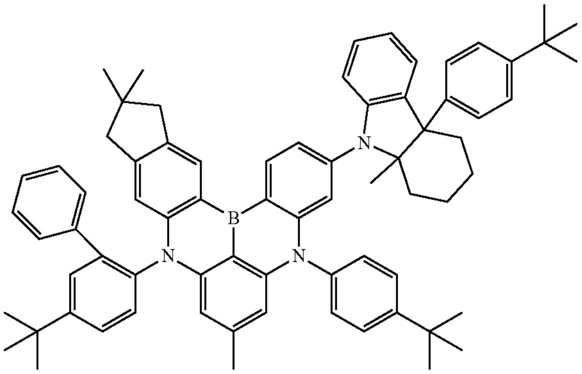
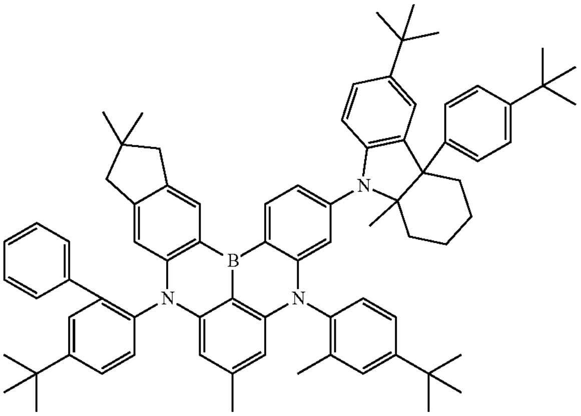
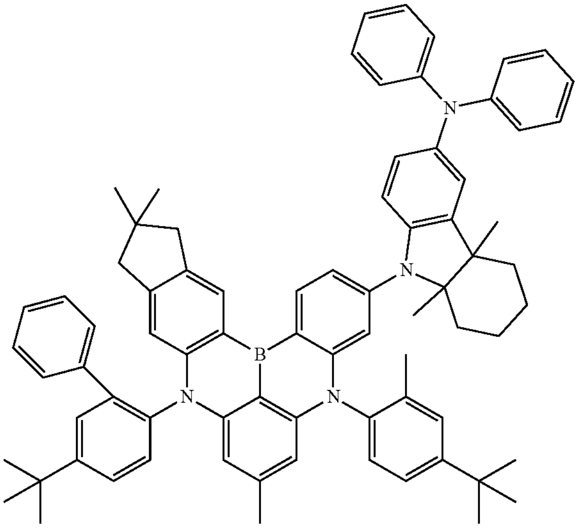

-continued
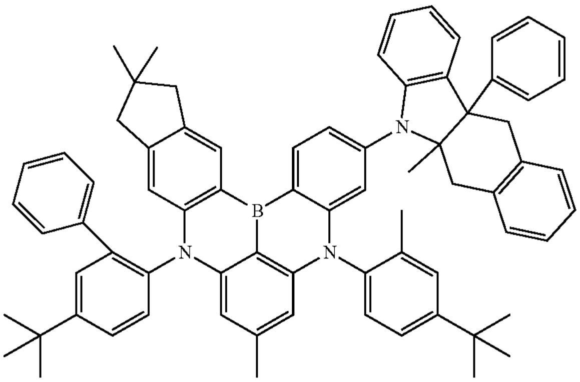
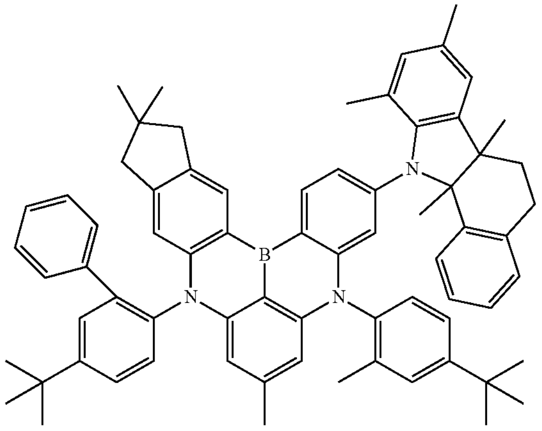
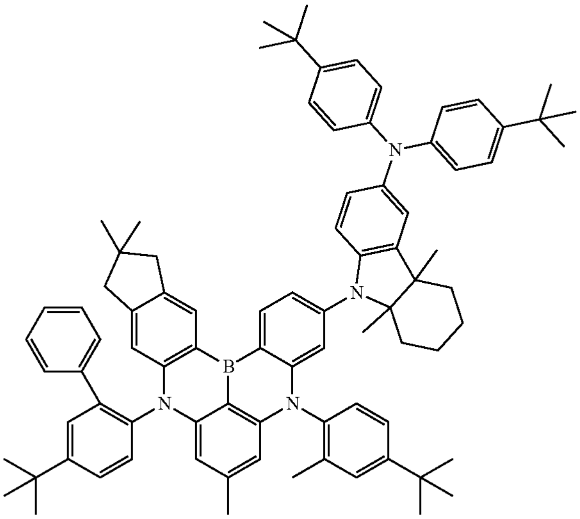
-continued
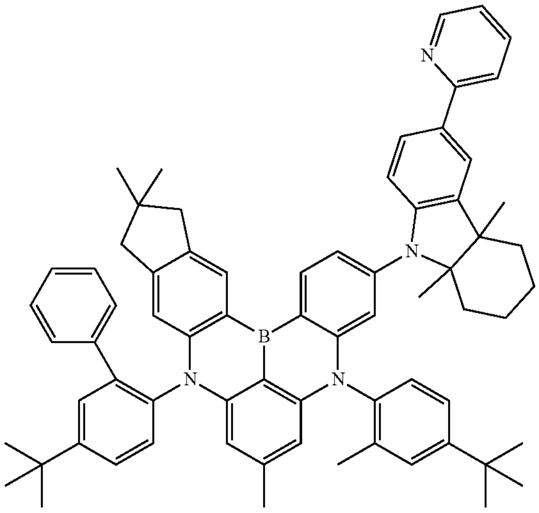
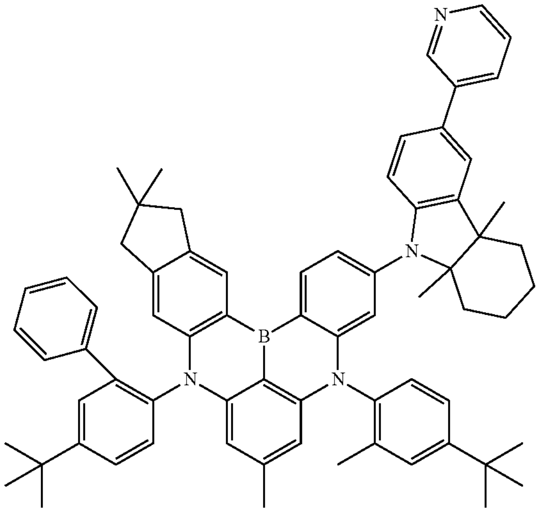
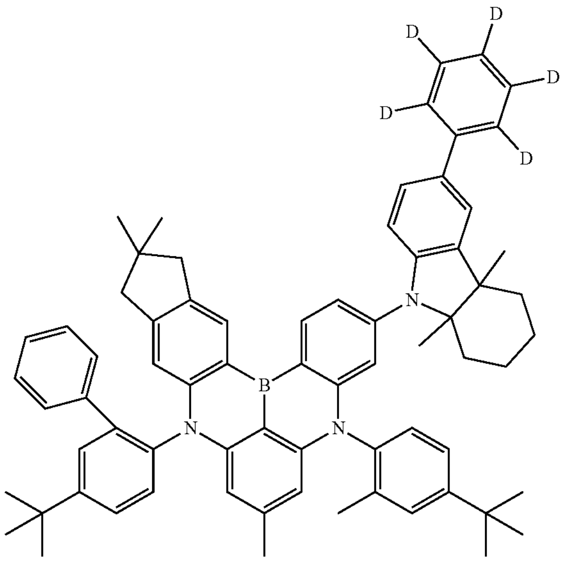

-continued
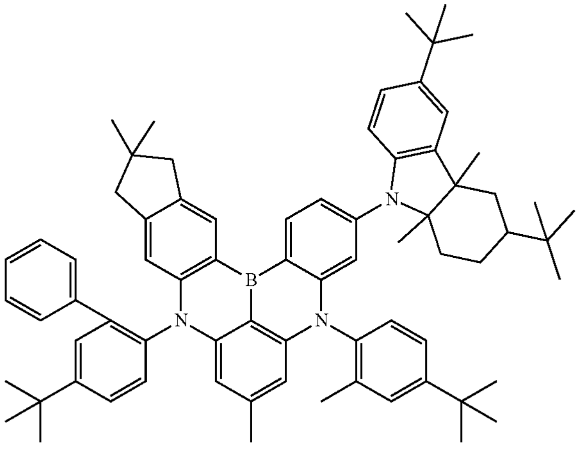
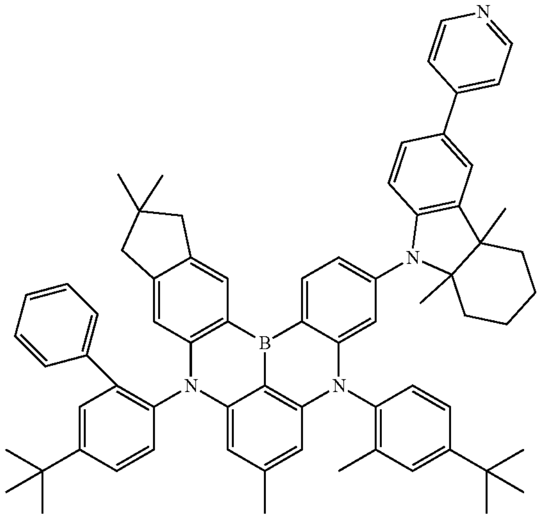
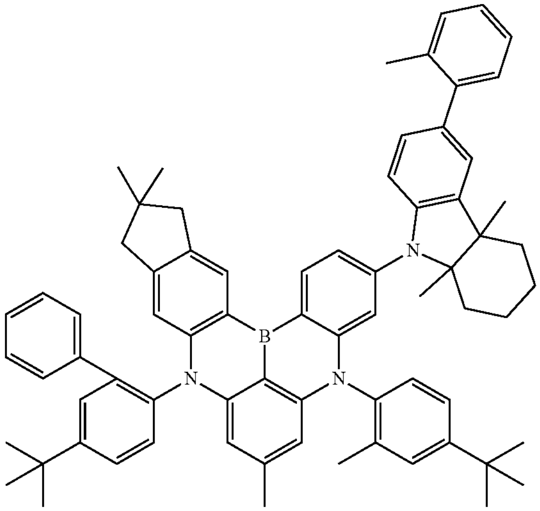
-continued
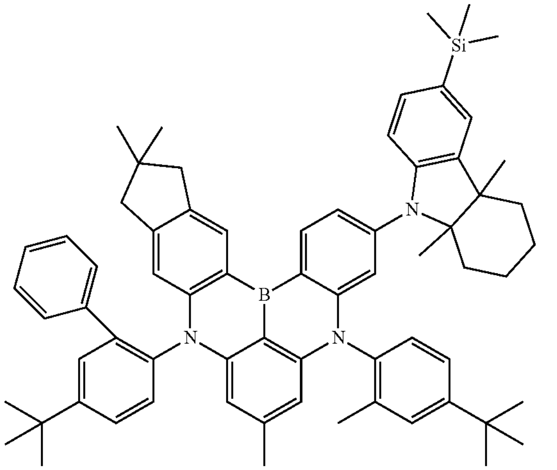
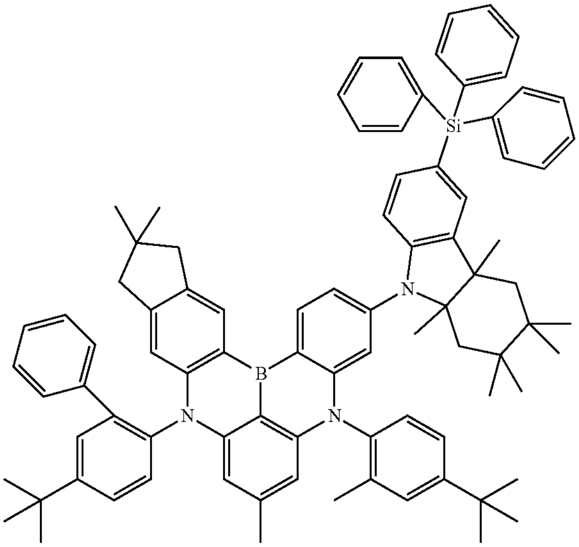
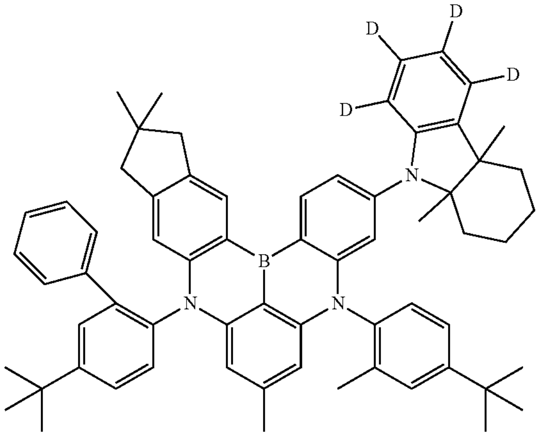

-continued
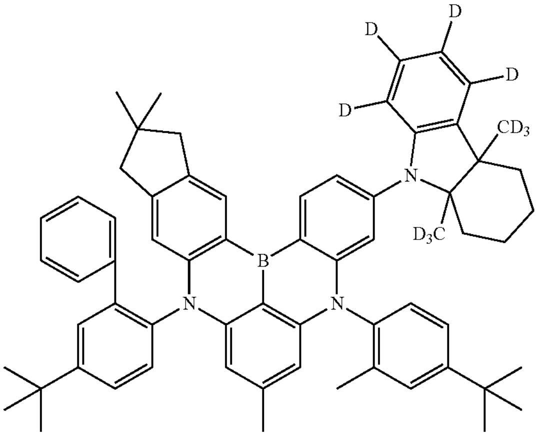
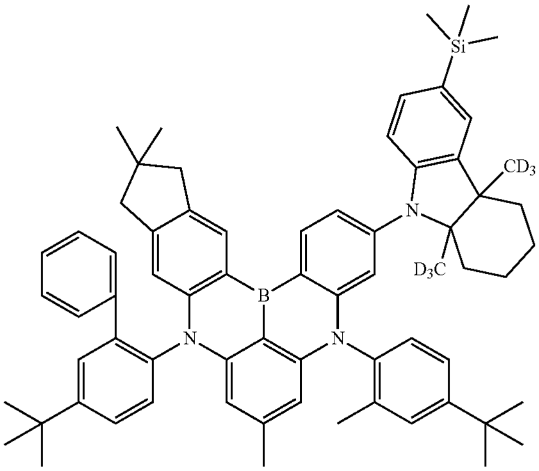
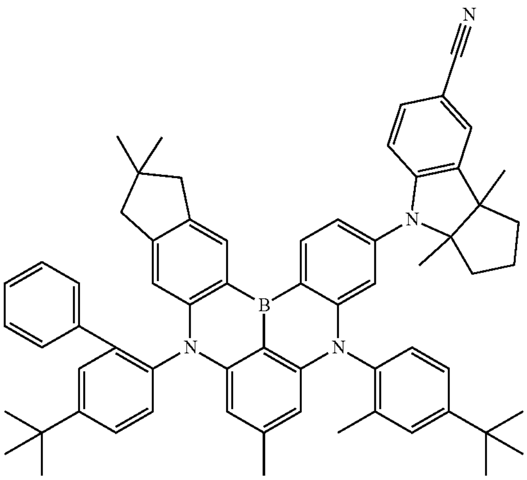
-continued
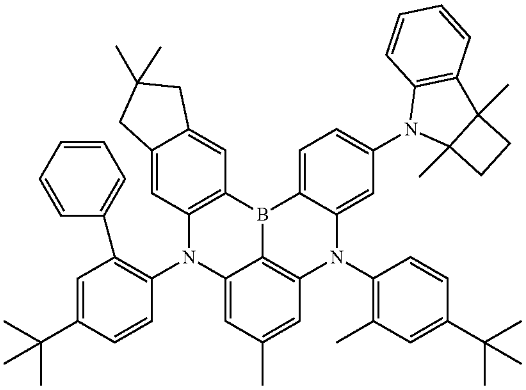
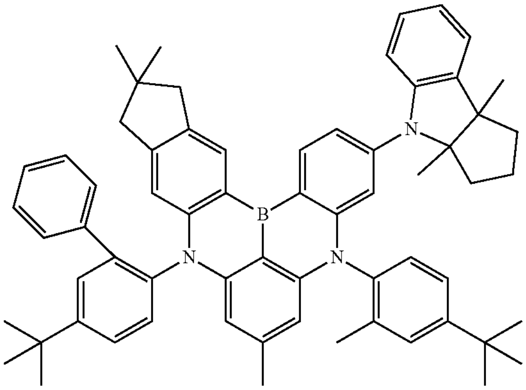
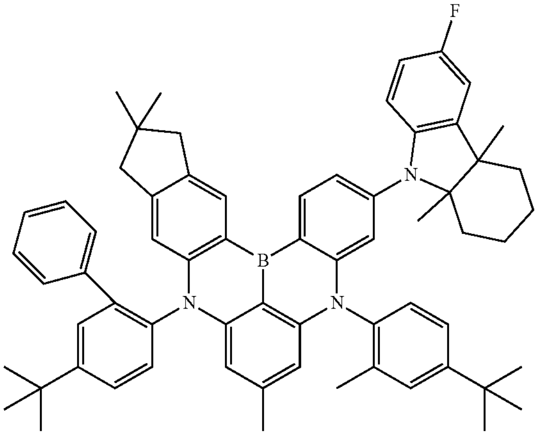

-continued
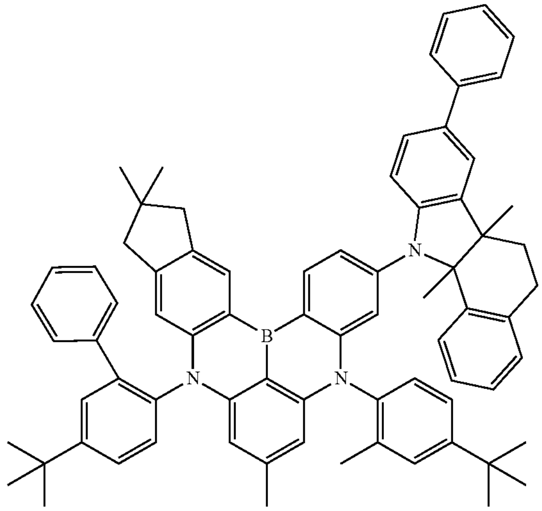
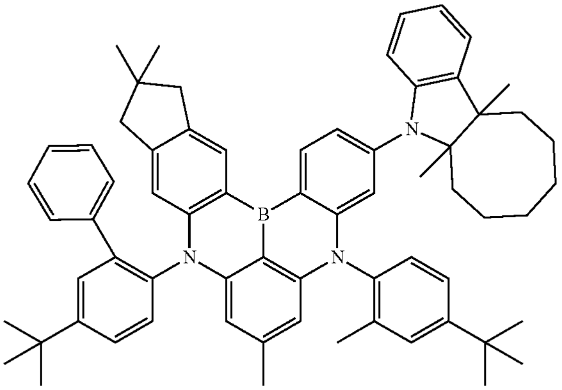
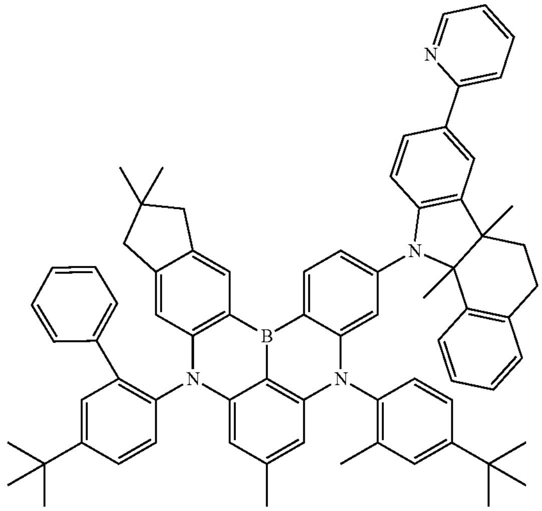
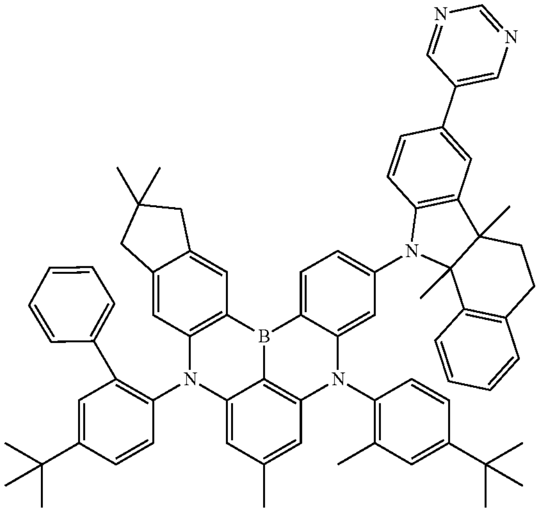
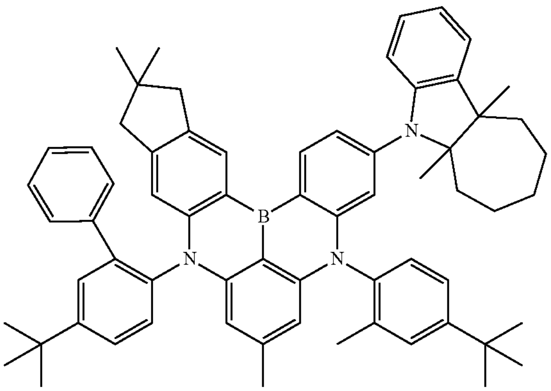
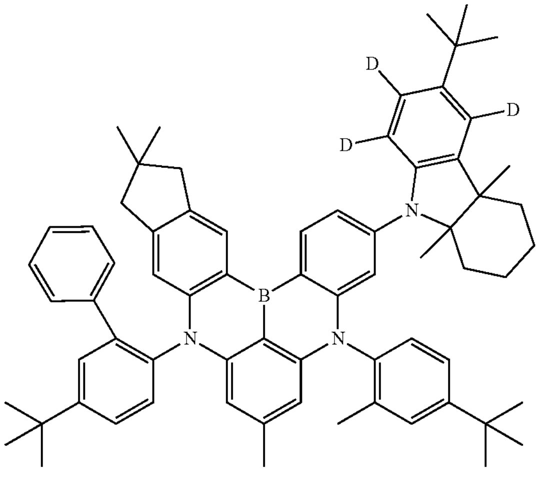

-continued
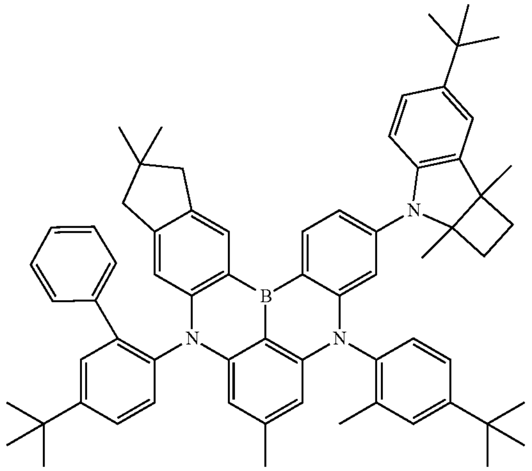
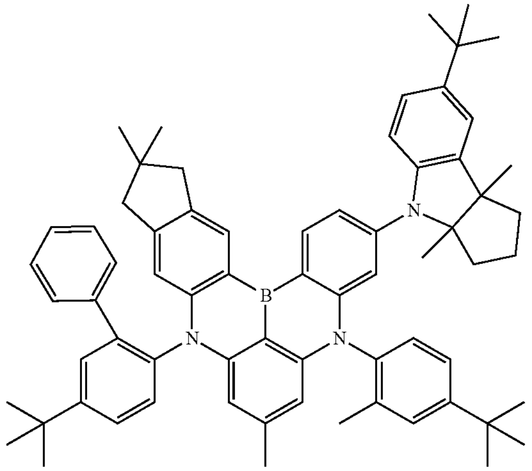
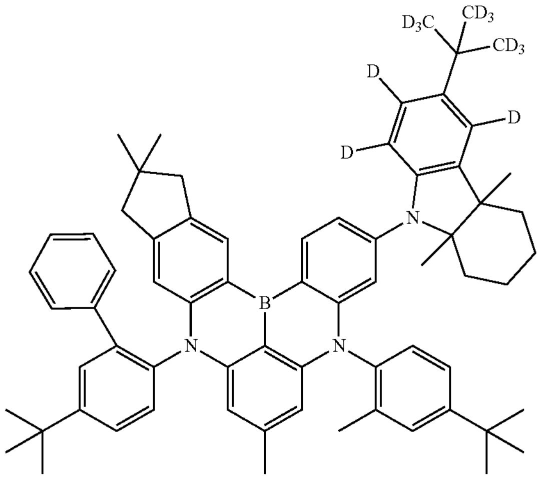
-continued
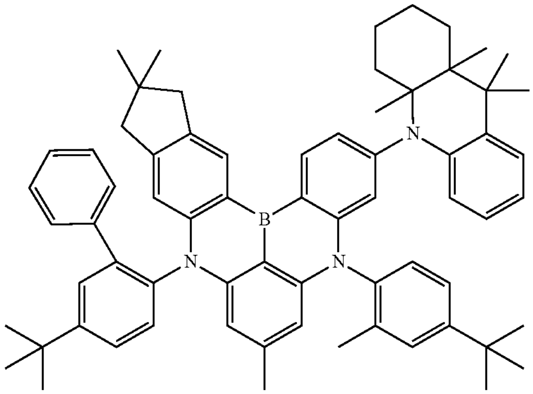
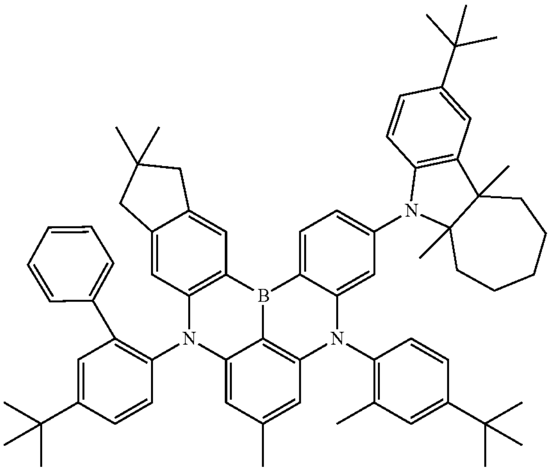
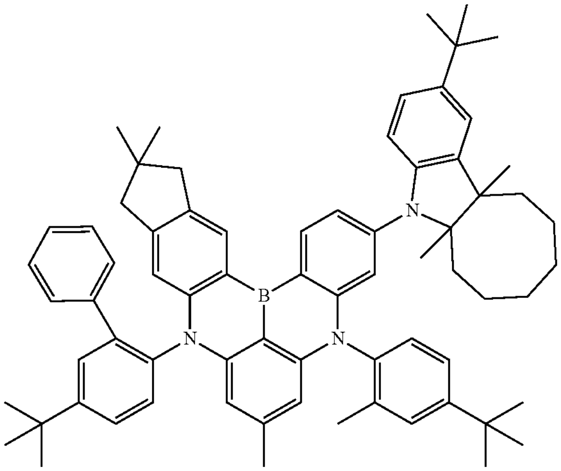

-continued
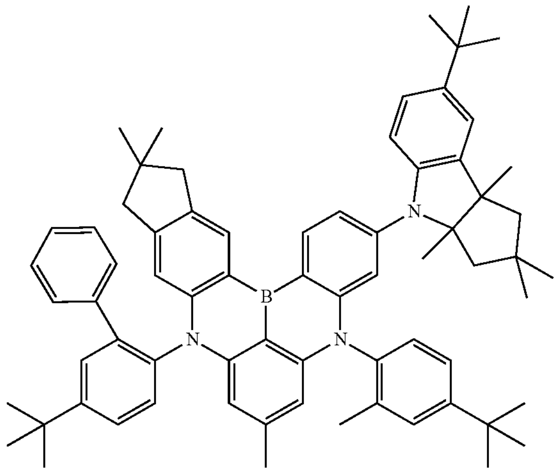
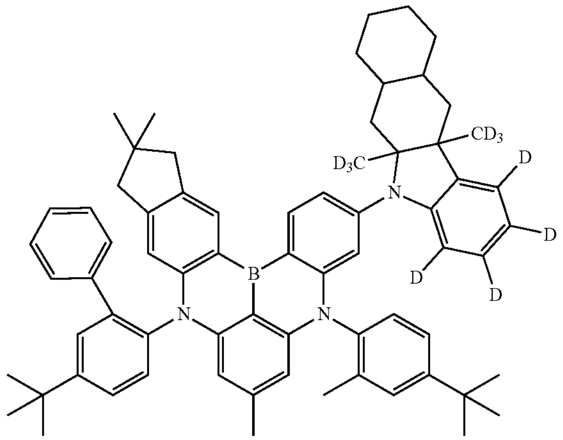
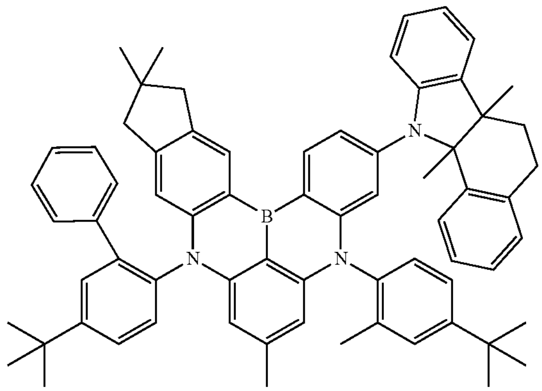
-continued
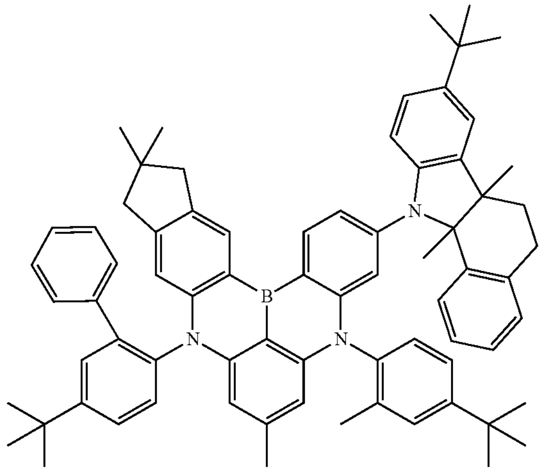
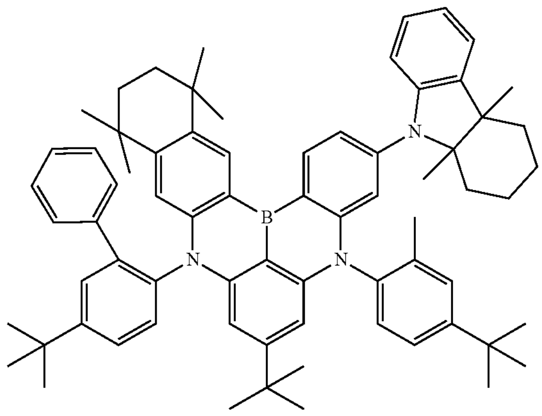
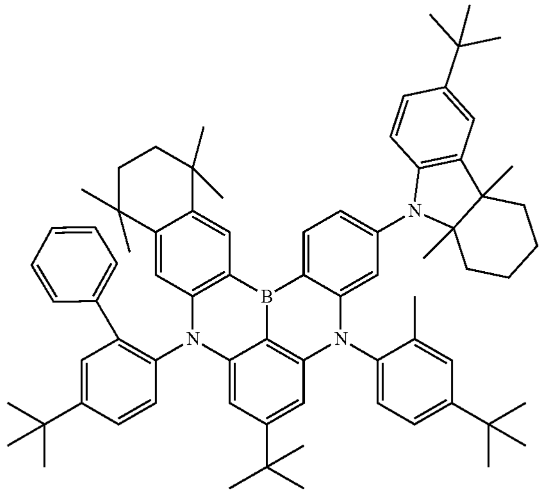

-continued
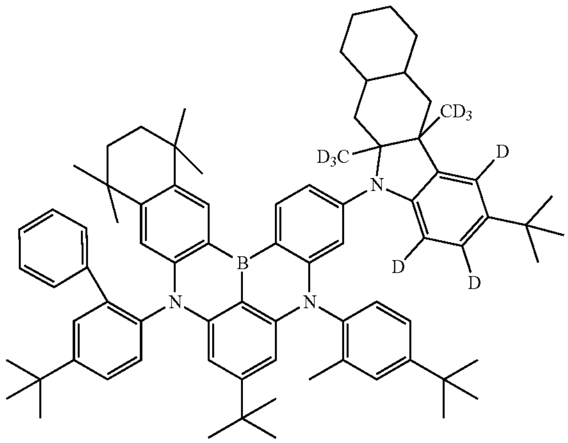
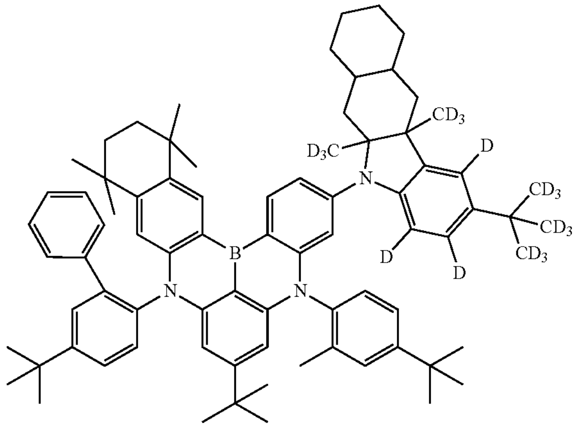
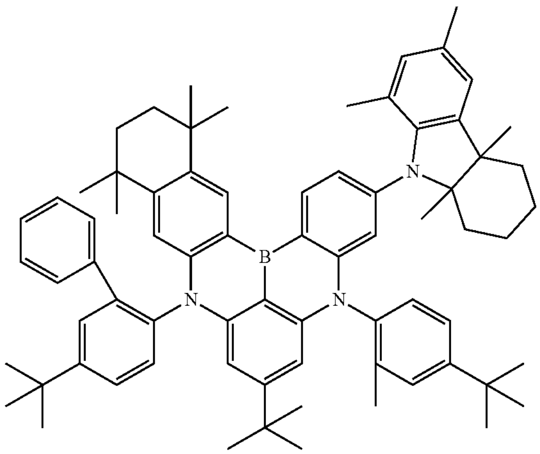
-continued
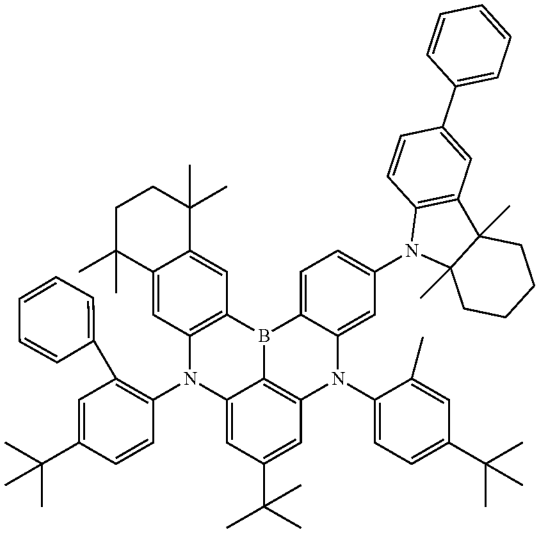
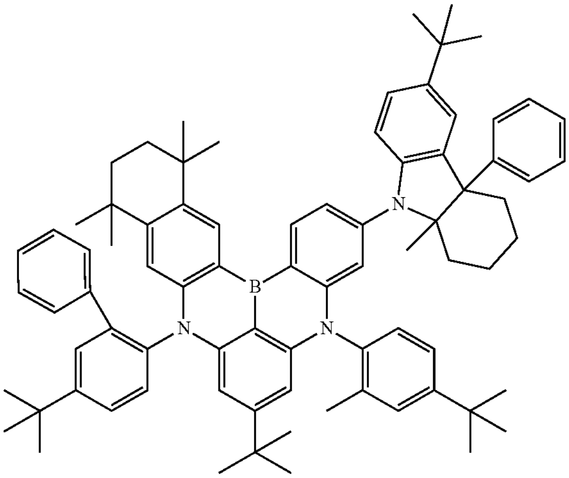
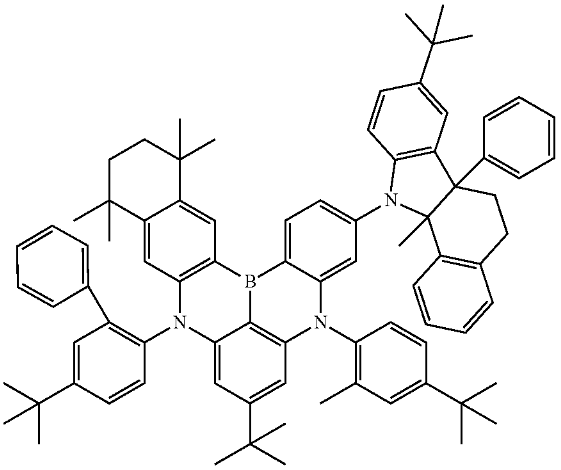

-continued
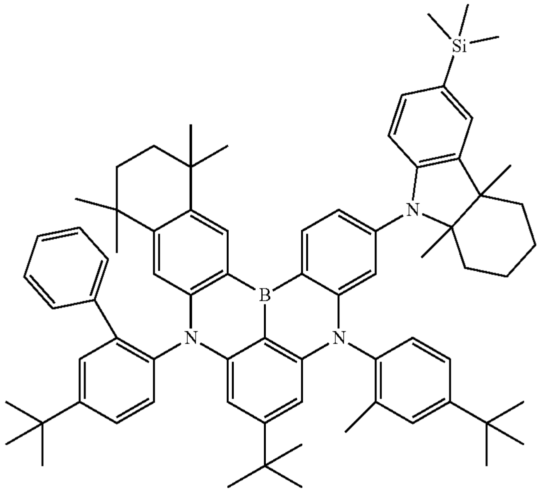
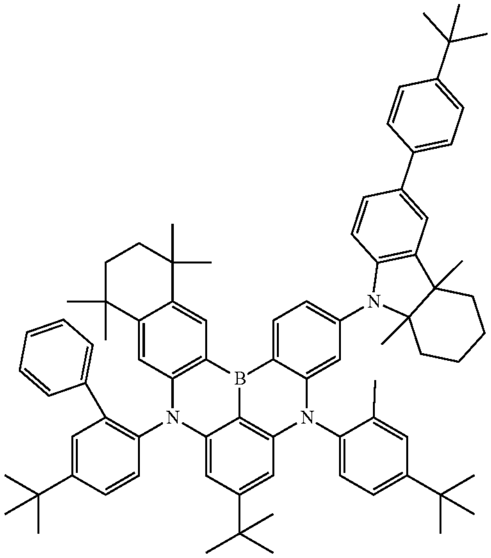
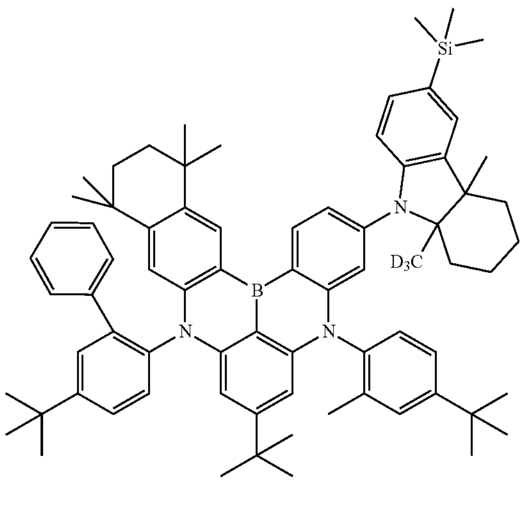
-continued
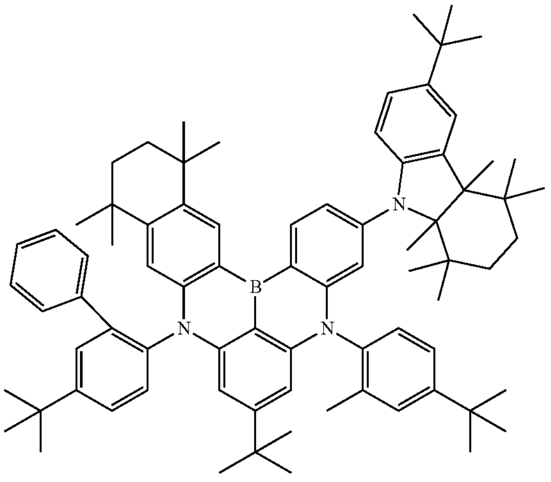
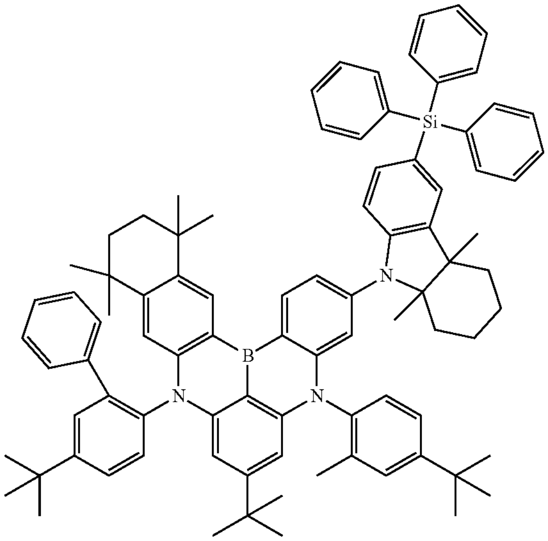
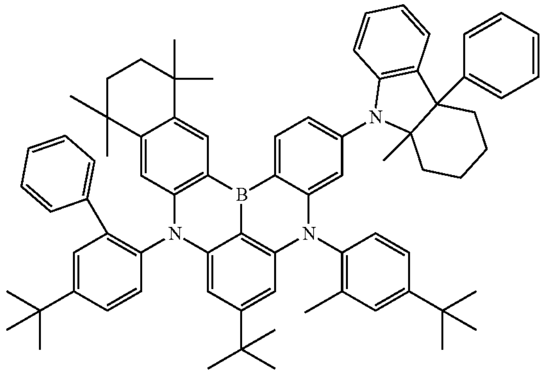

-continued
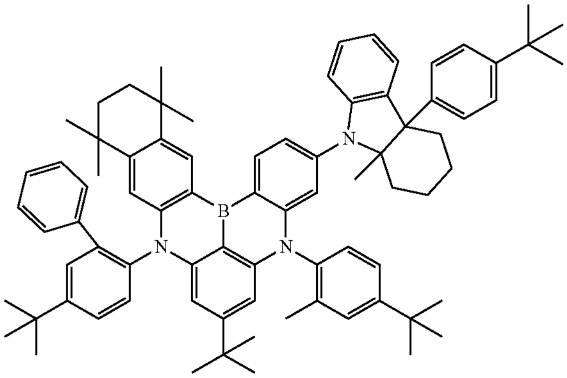
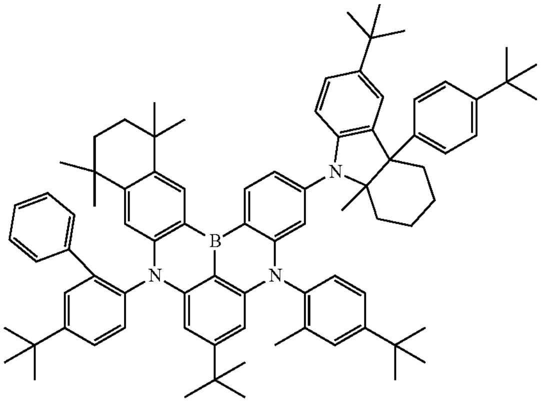
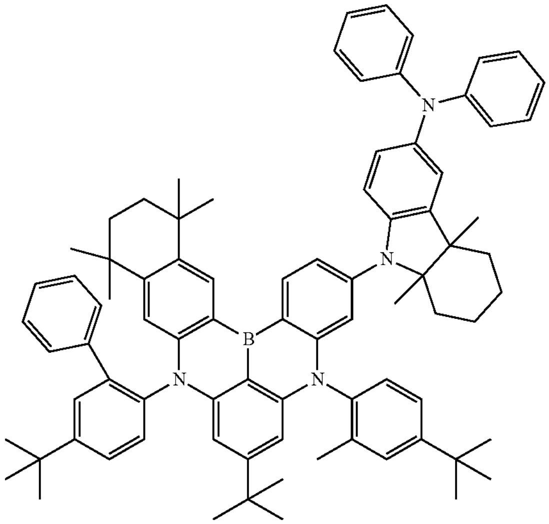
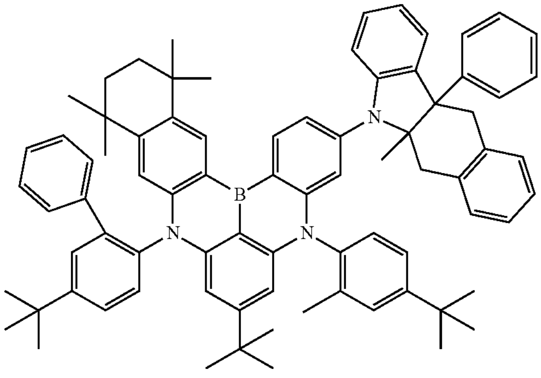
-continued
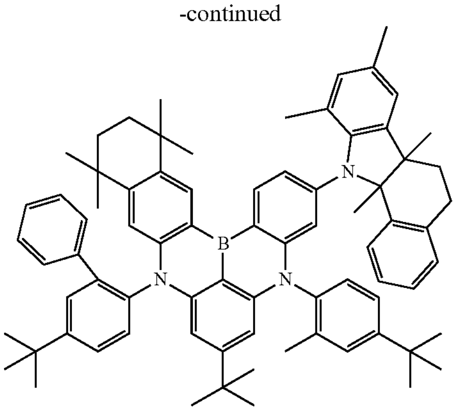
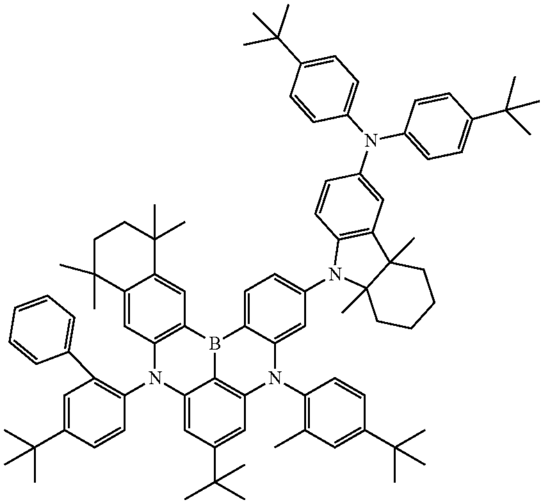
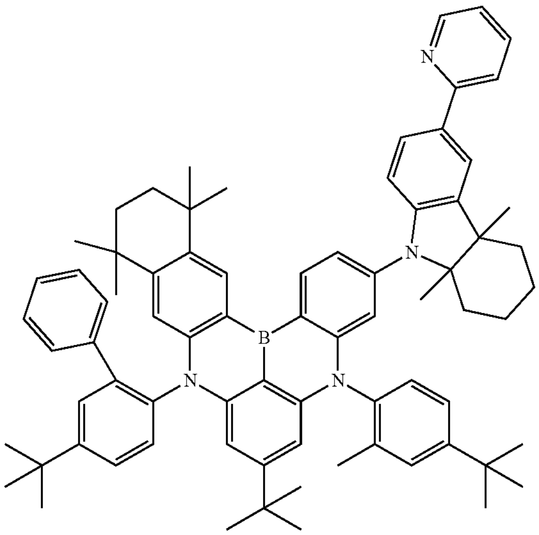

-continued
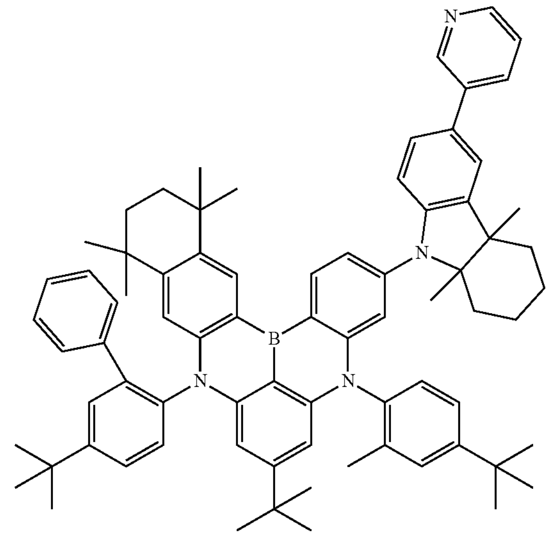
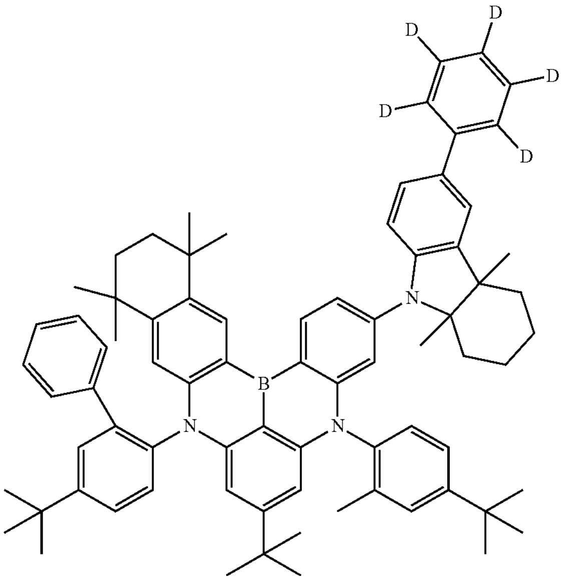
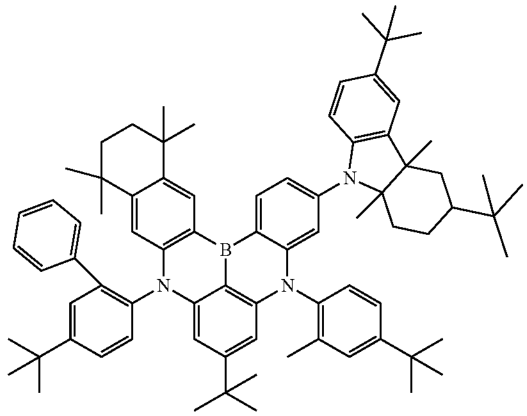
-continued
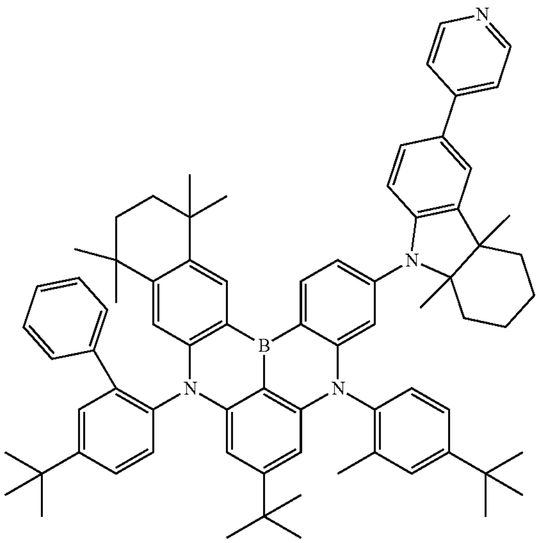
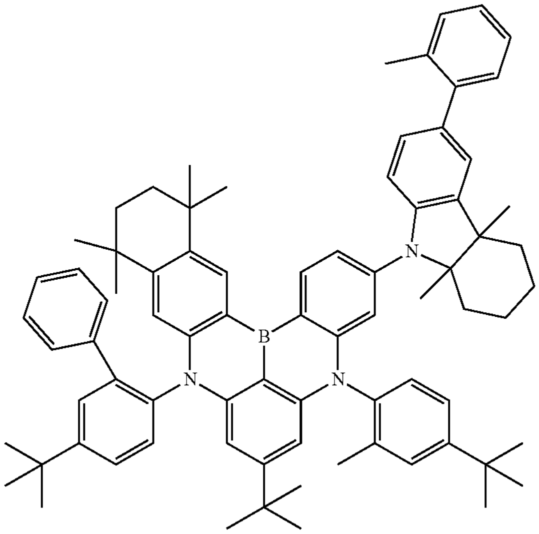
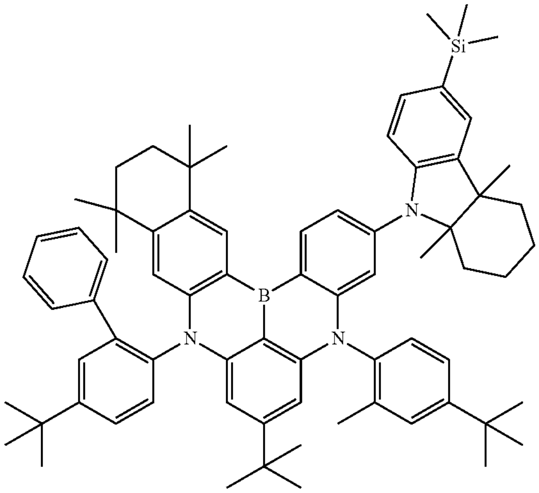

-continued
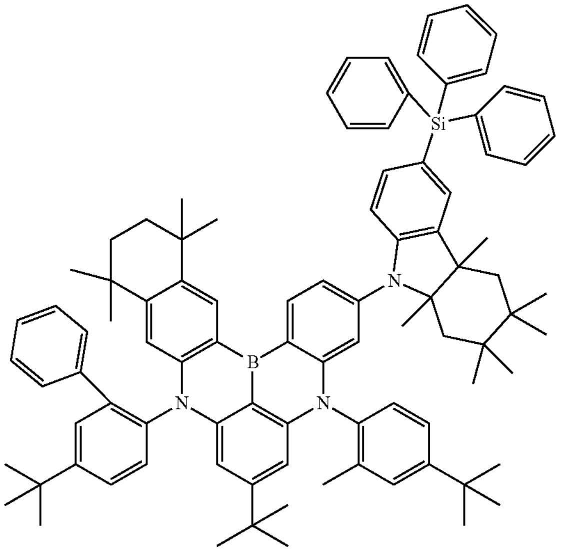
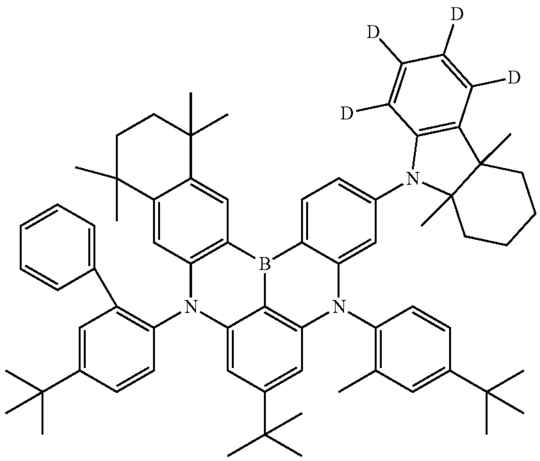
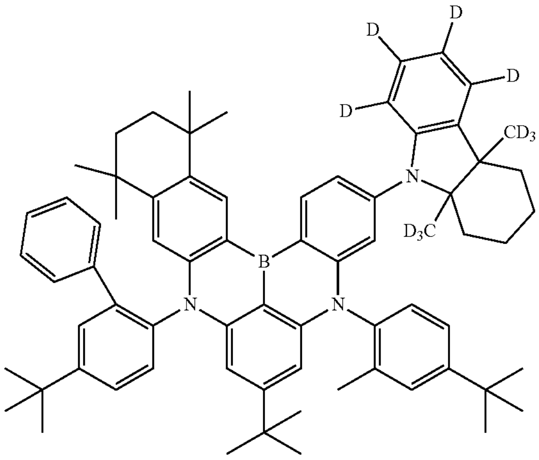
-continued
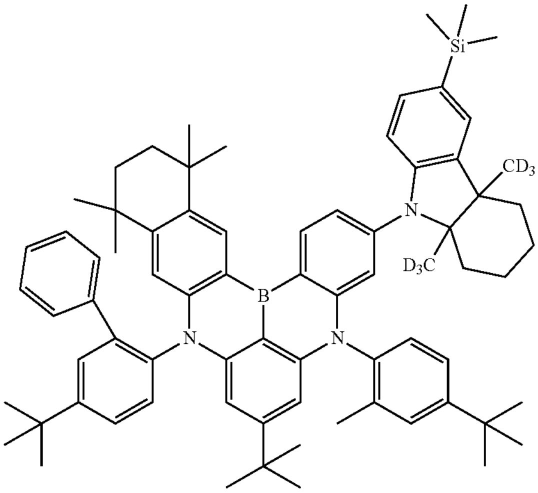
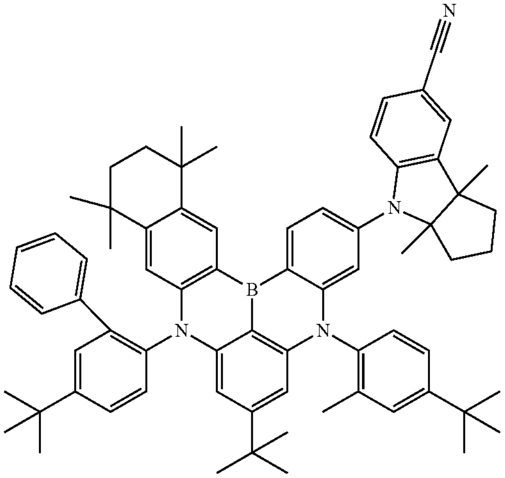
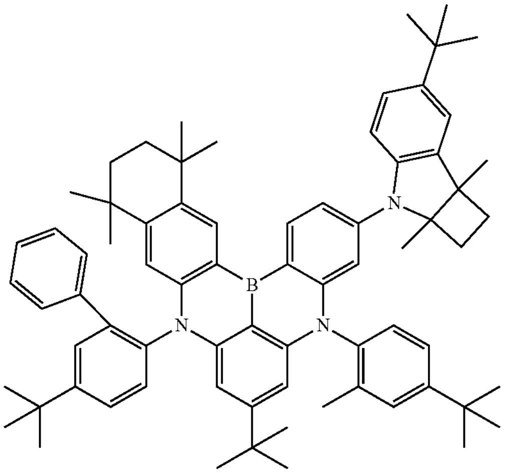

-continued
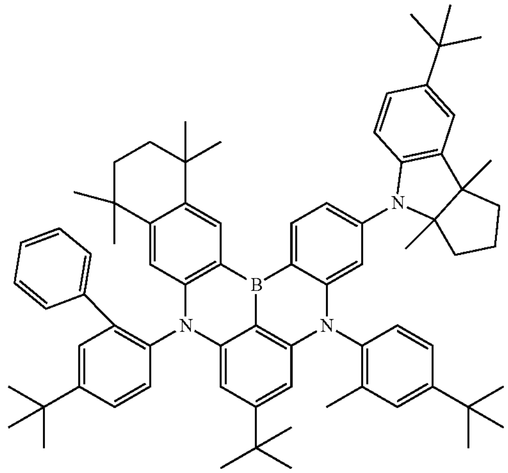
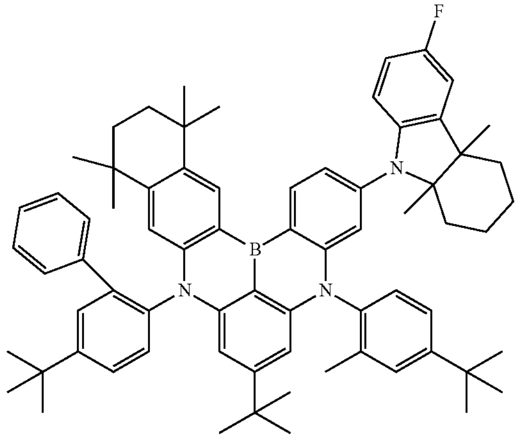
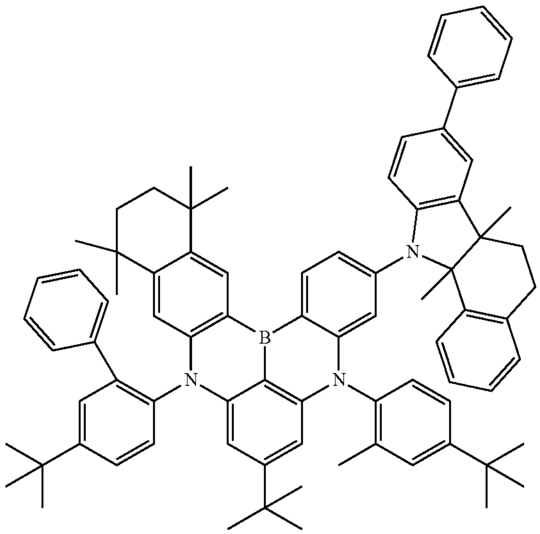
-continued
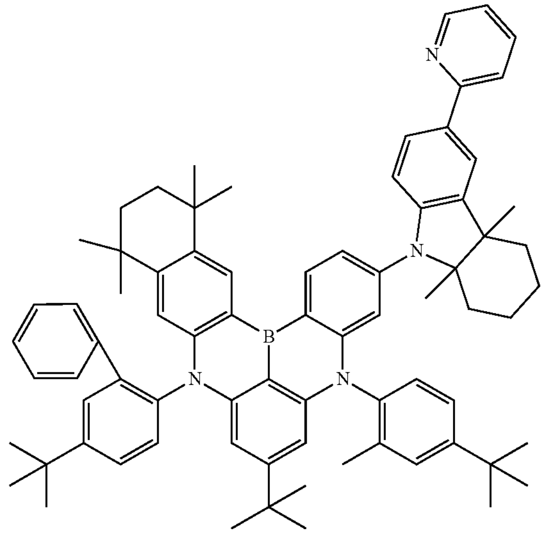
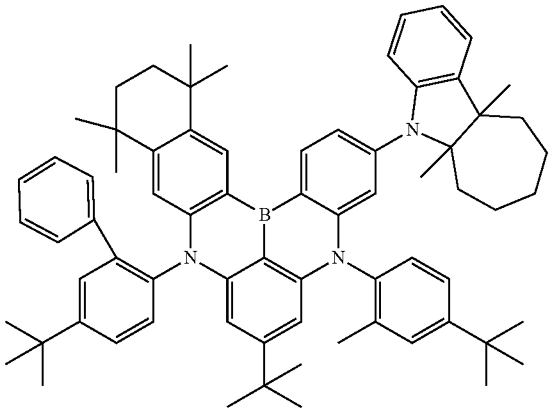
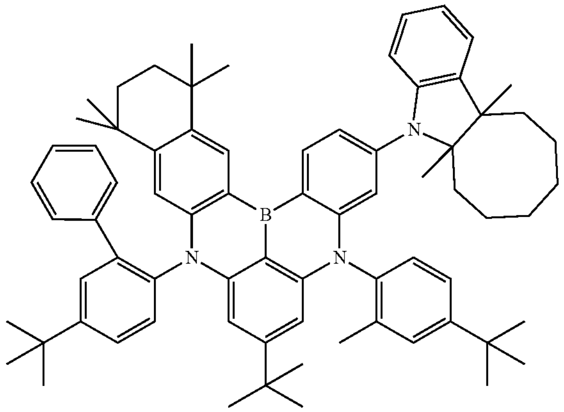

-continued
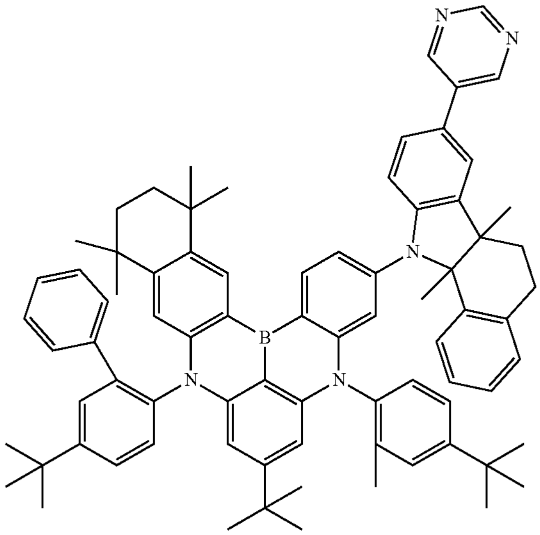
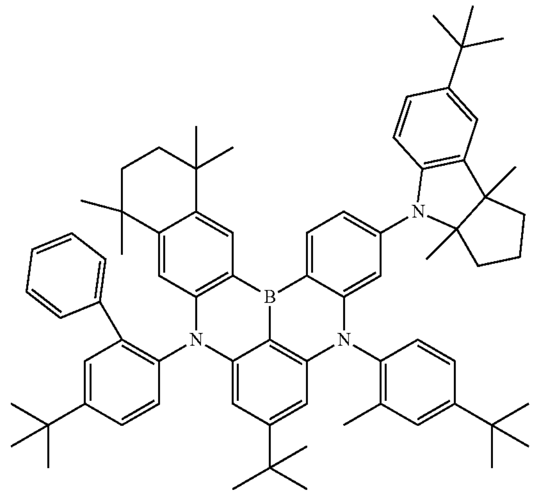
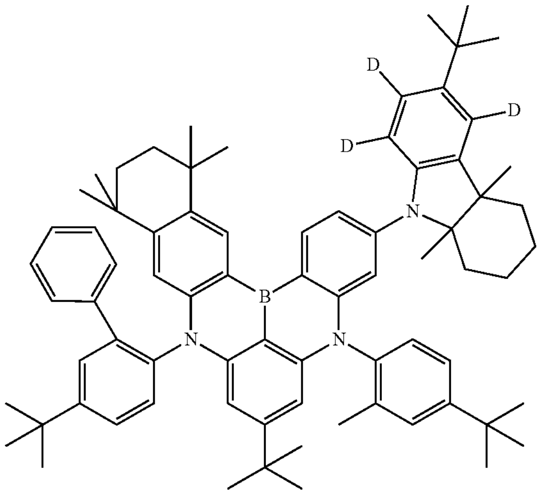
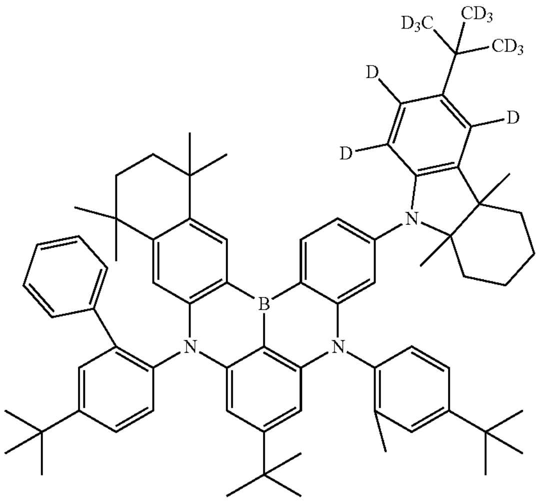
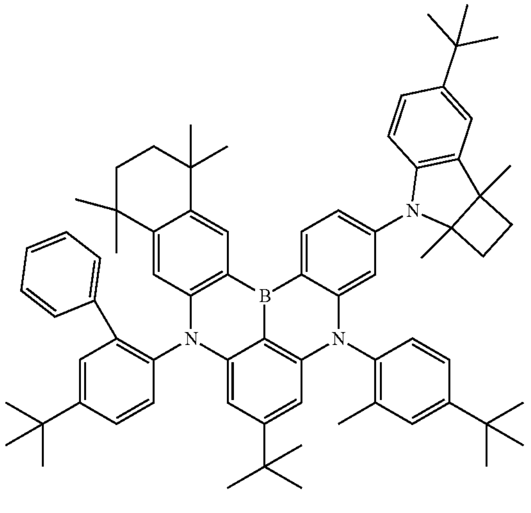
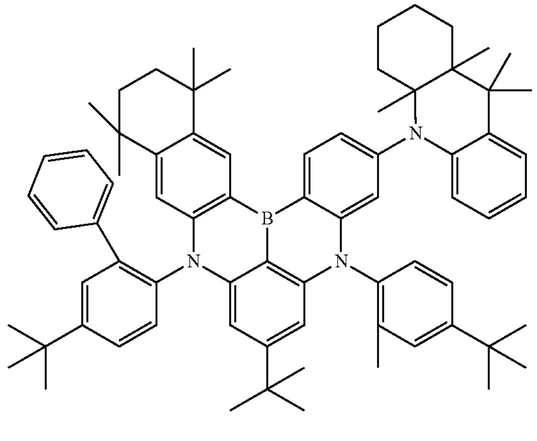
-continued -continued
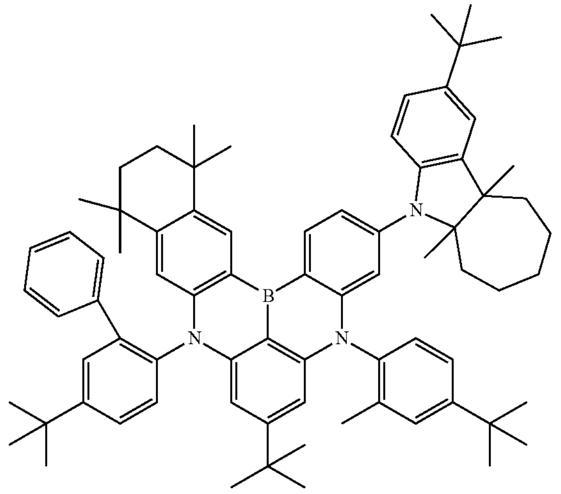
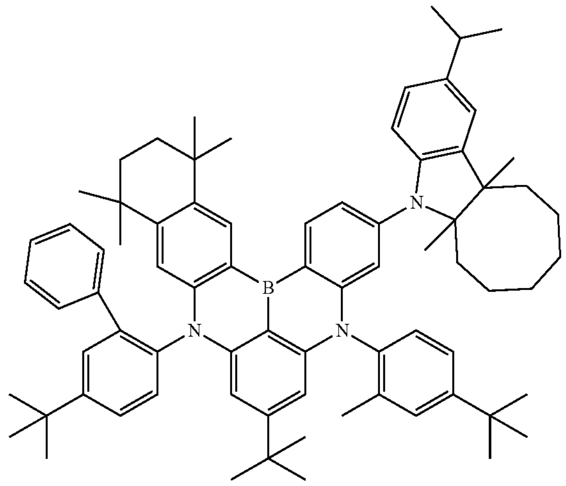
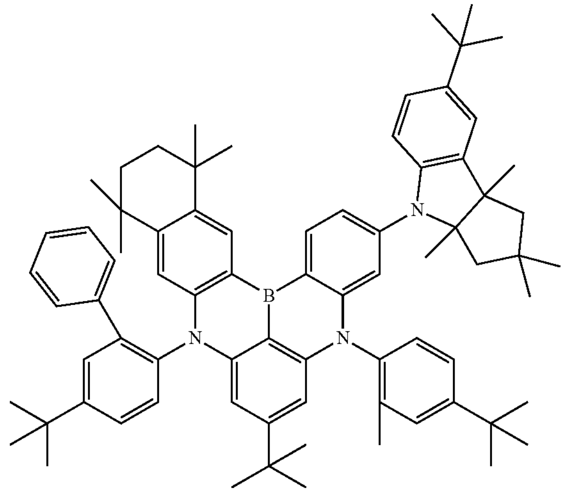
-continued
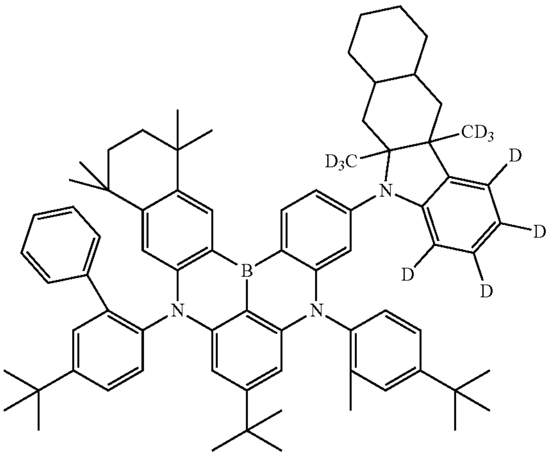
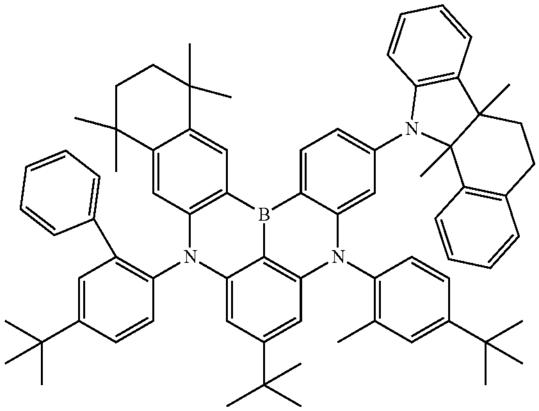
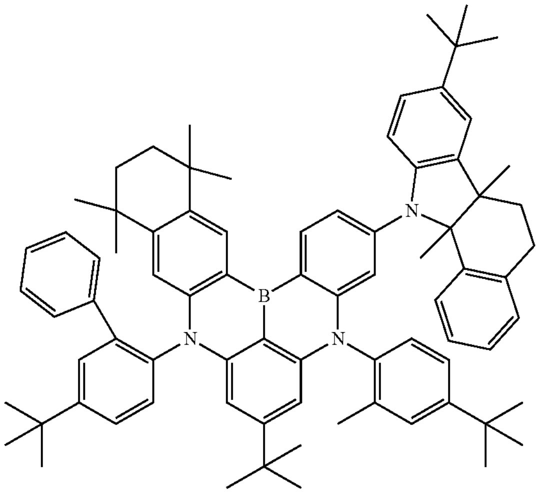

-continued
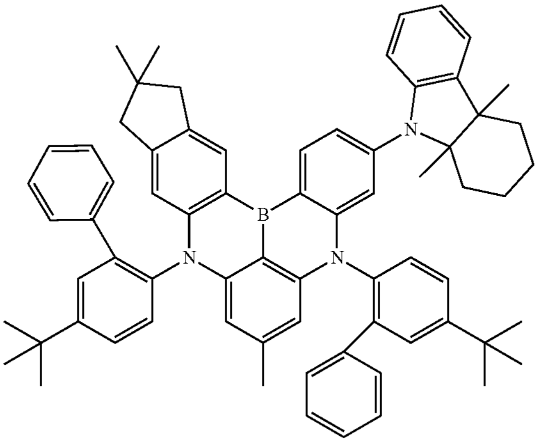
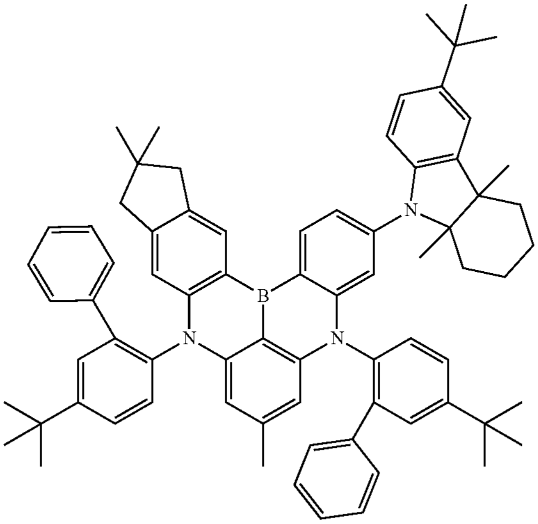
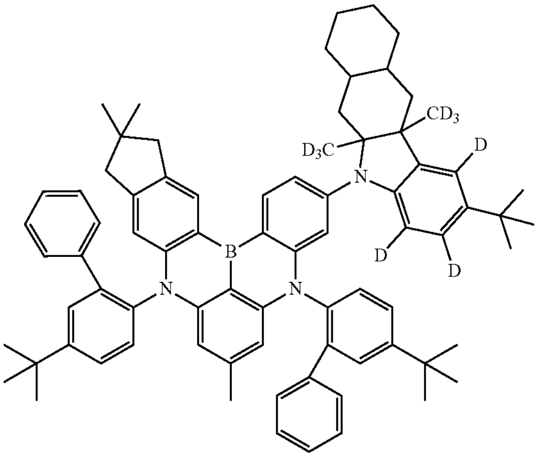
-continued
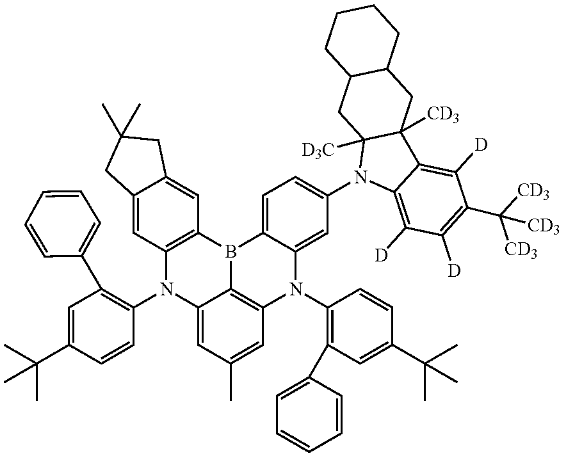
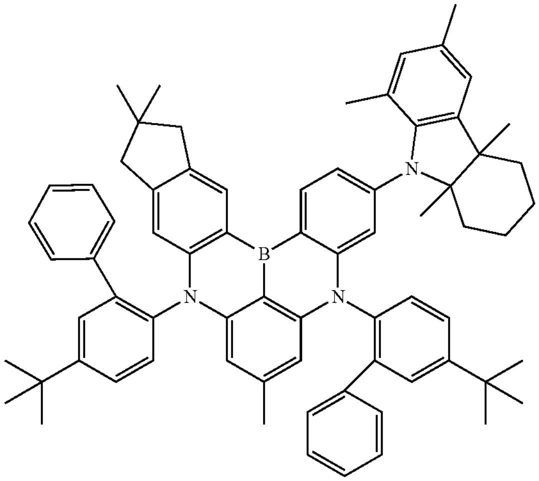
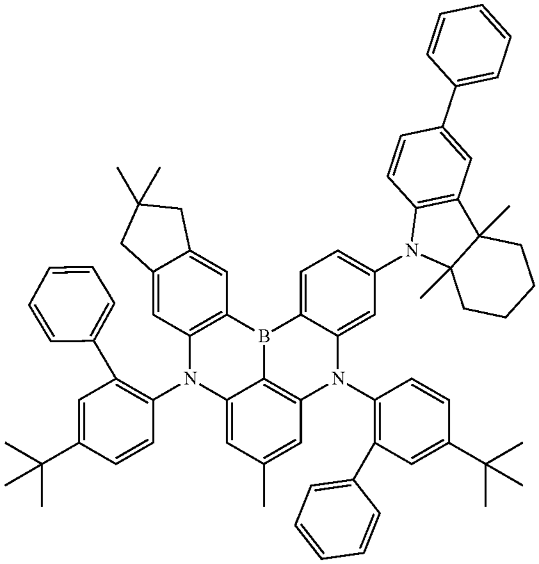

-continued
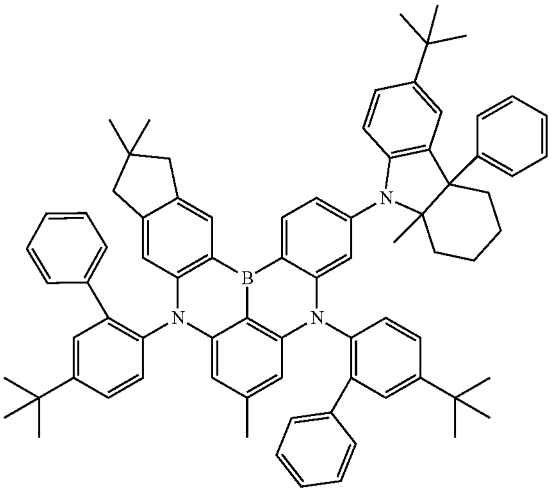
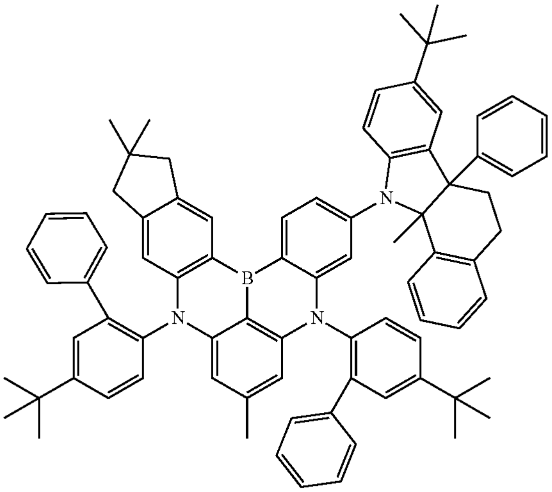
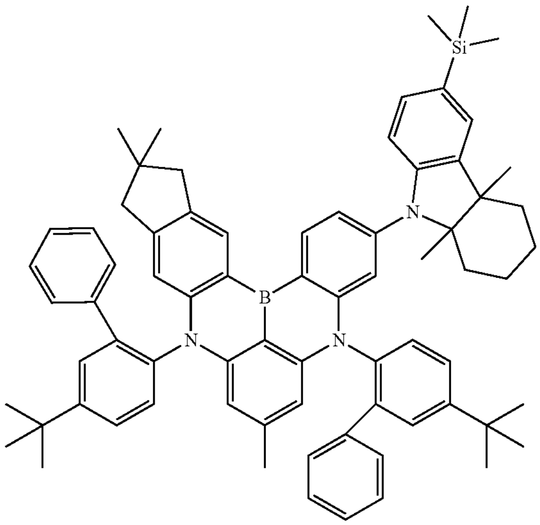
-continued
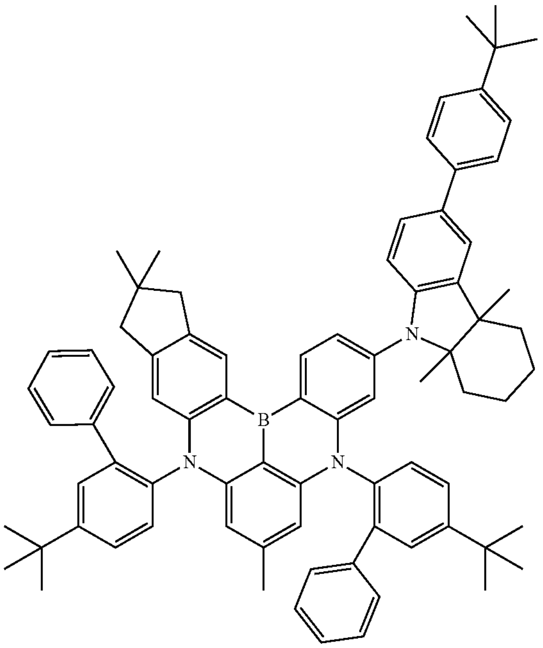
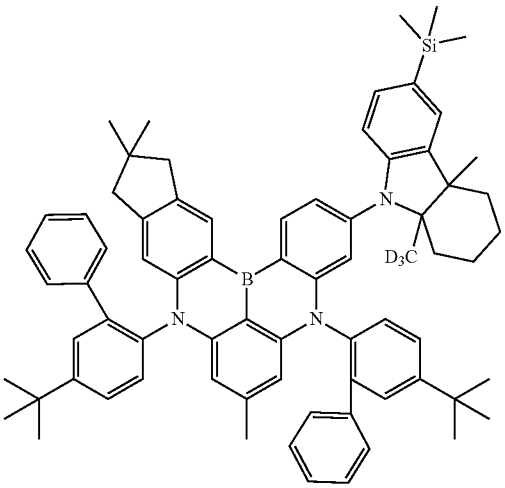
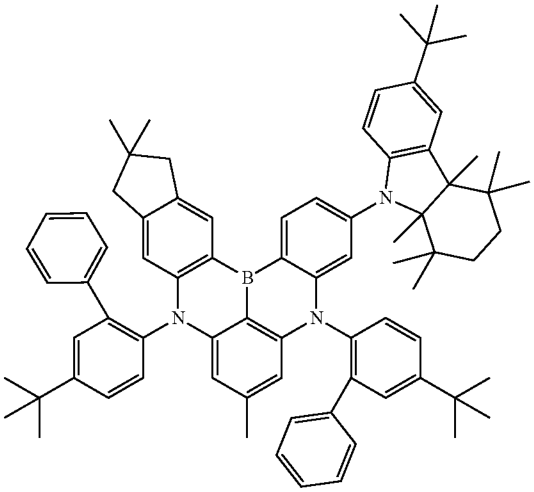

-continued
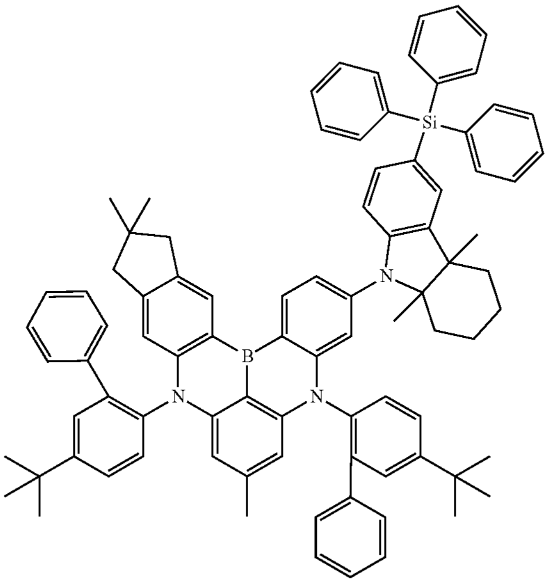
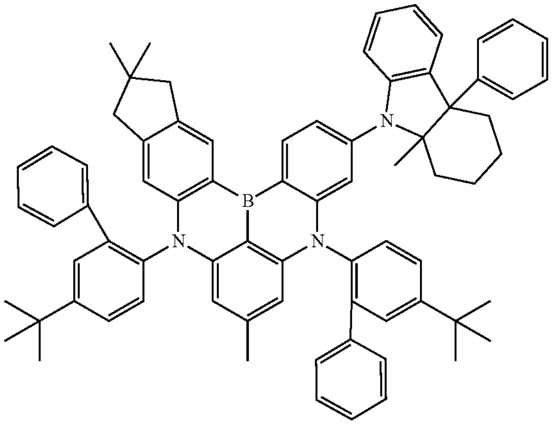
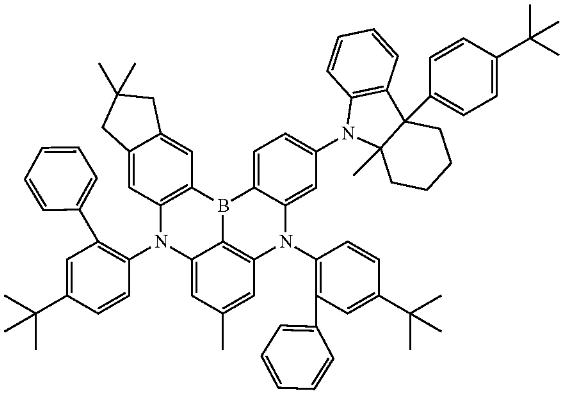
-continued
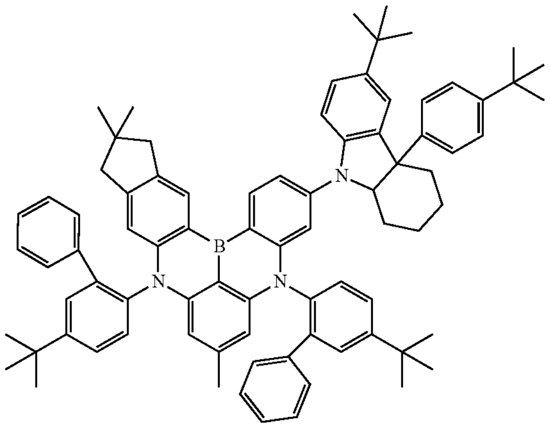
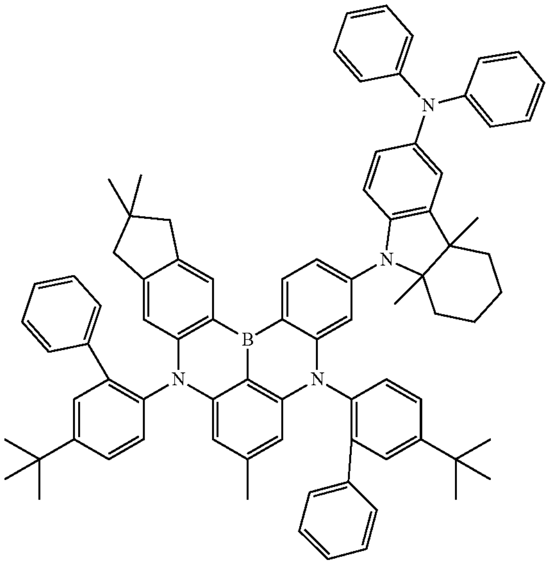
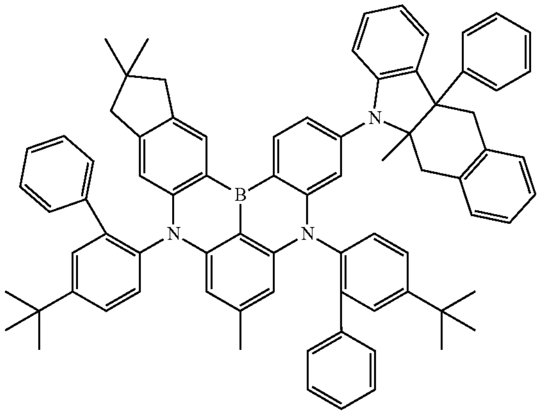

-continued
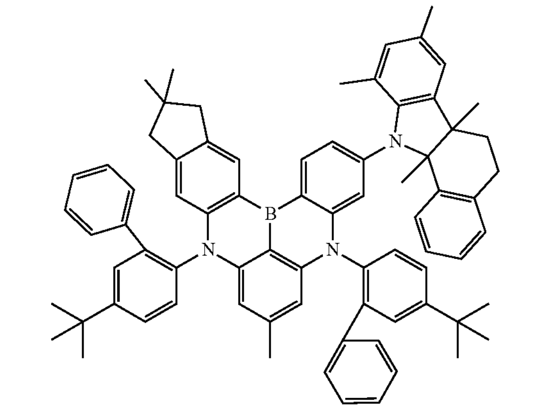
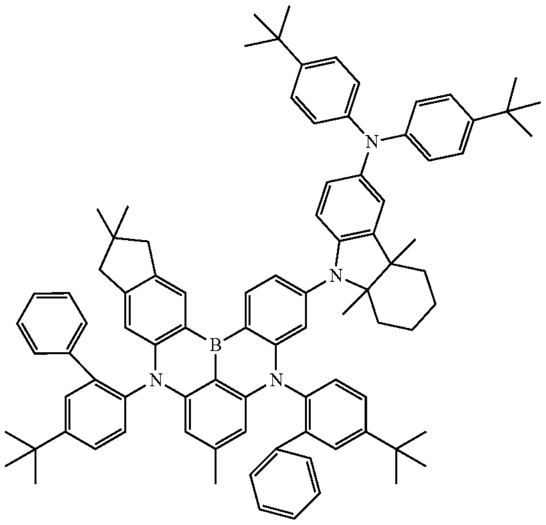
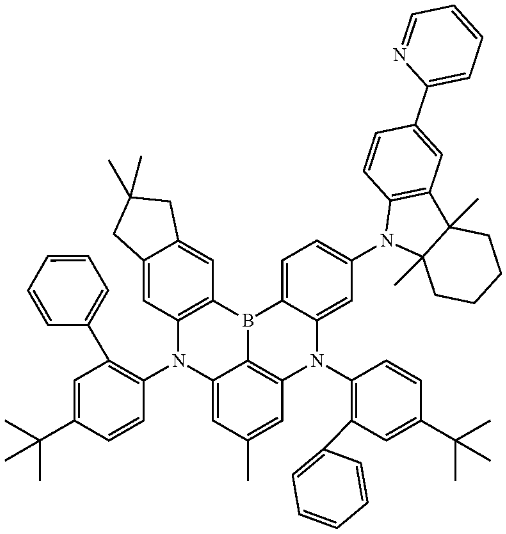
-continued
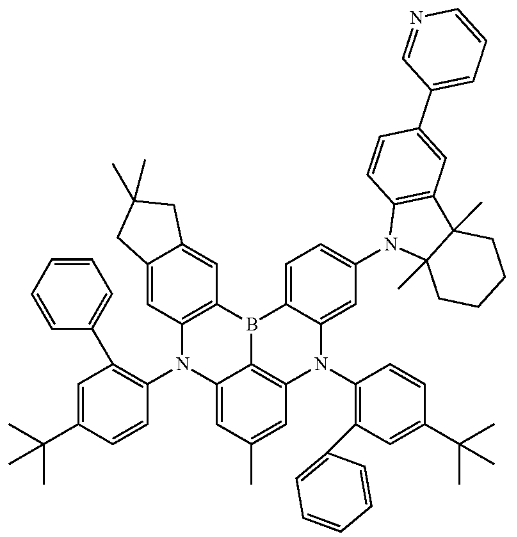
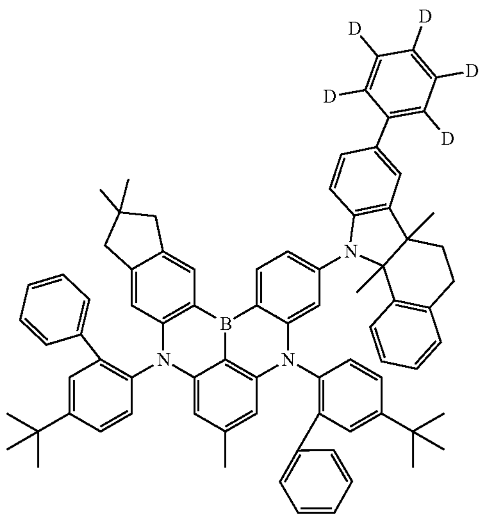
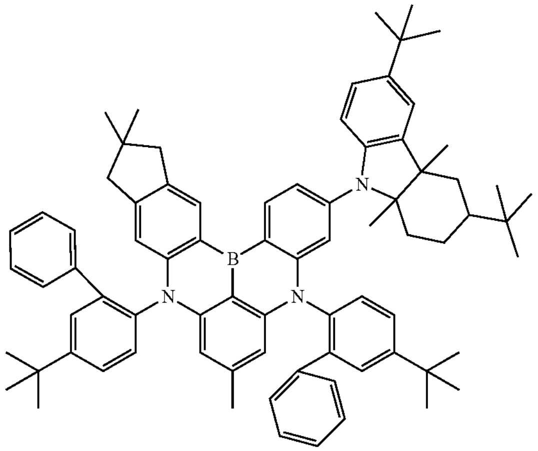

-continued
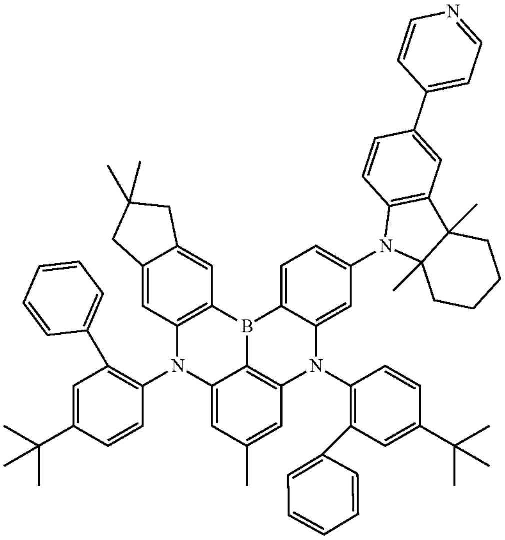
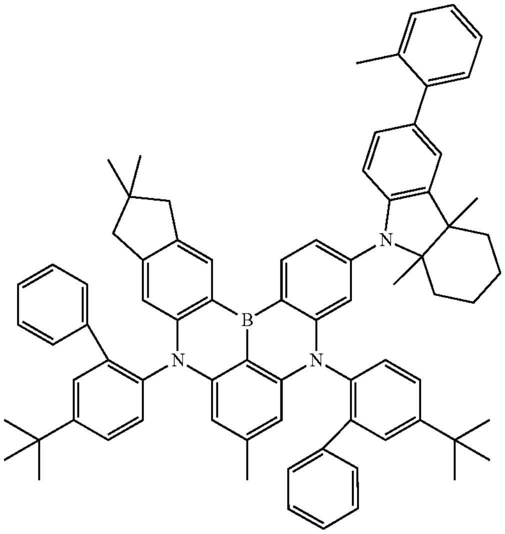
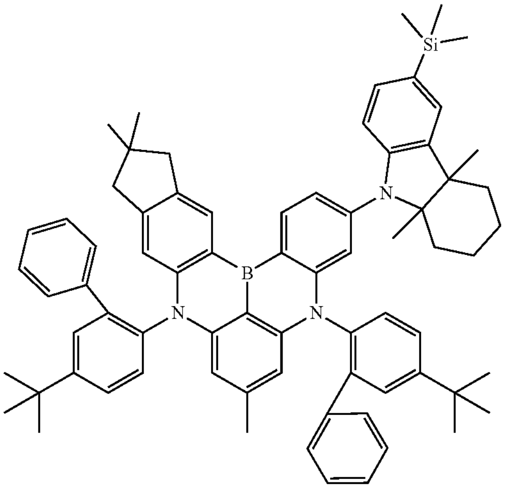
-continued
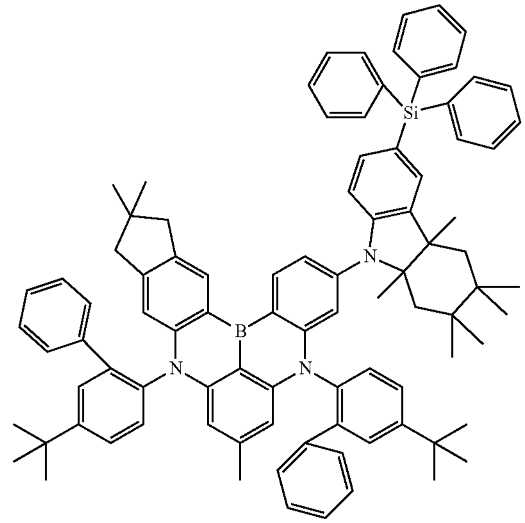
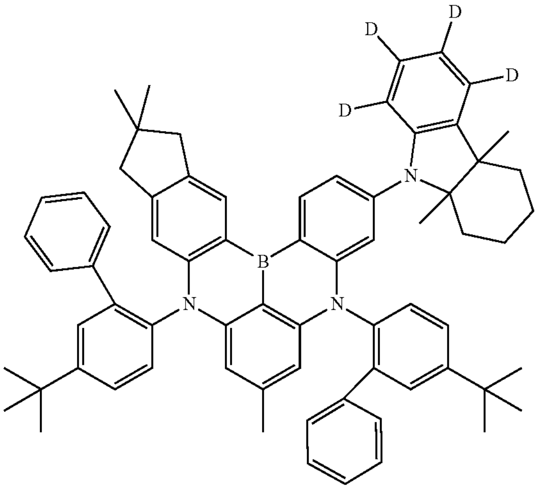
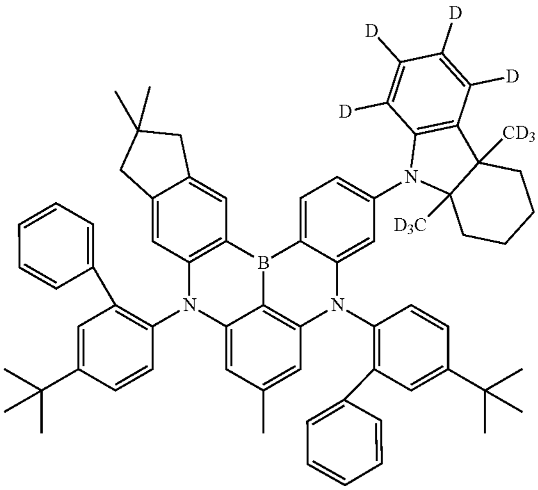

-continued
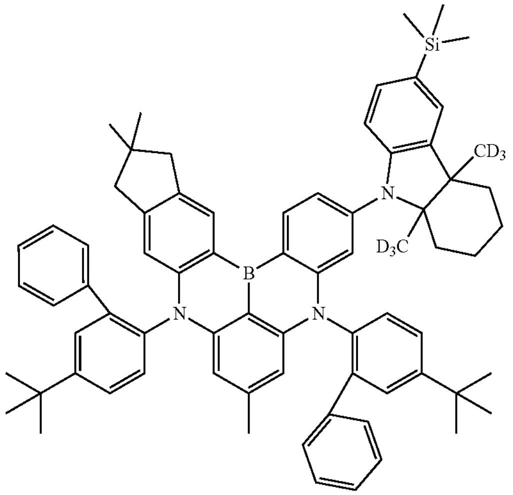
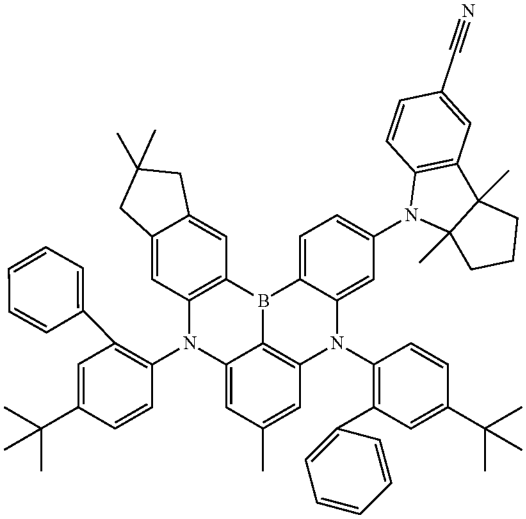
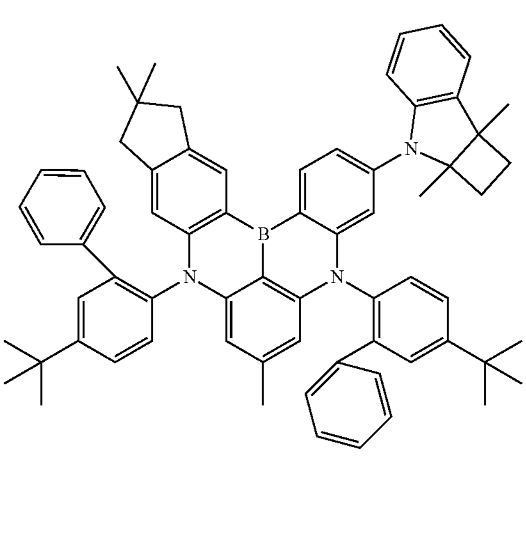
-continued
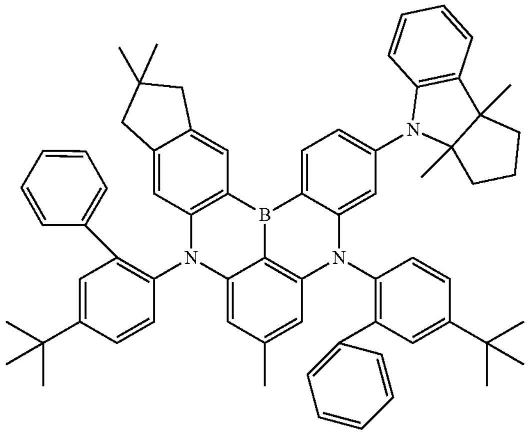
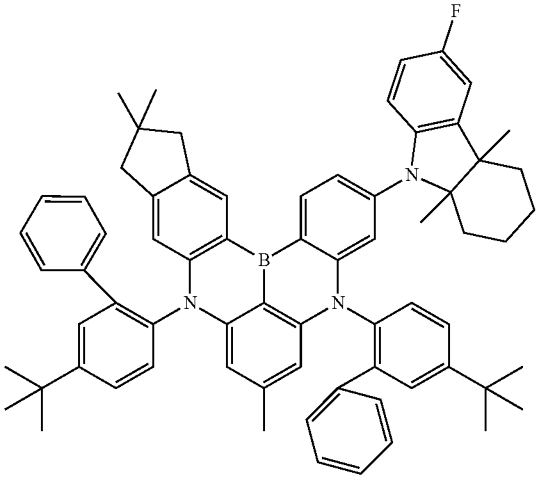
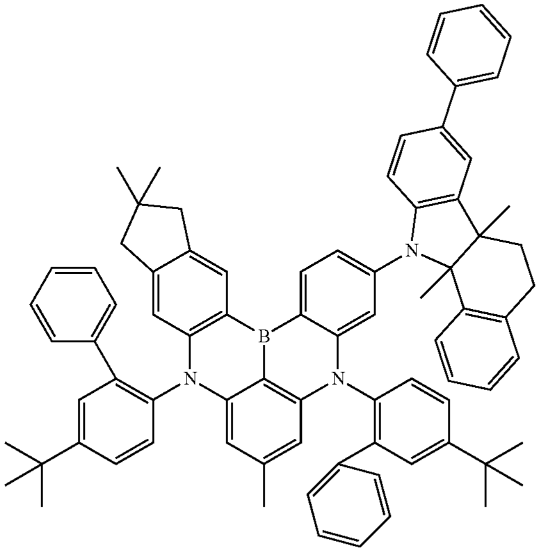

-continued
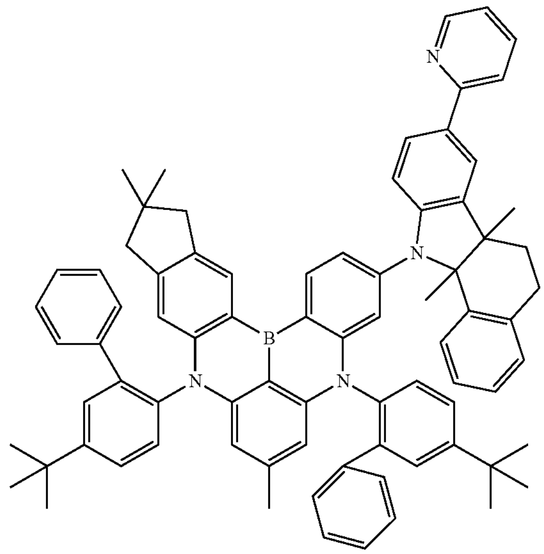
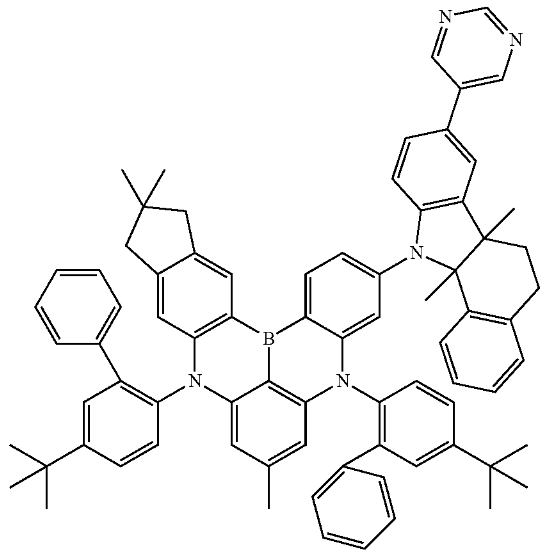
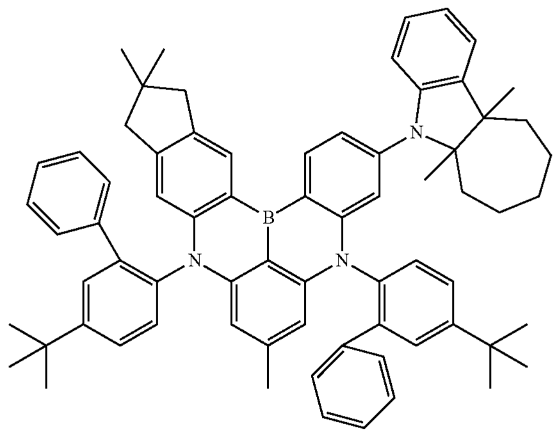
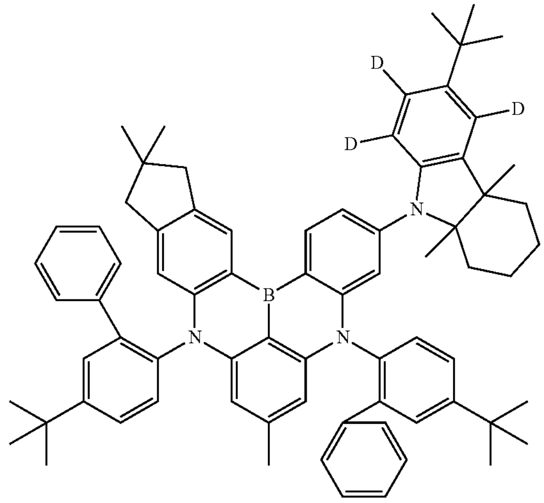
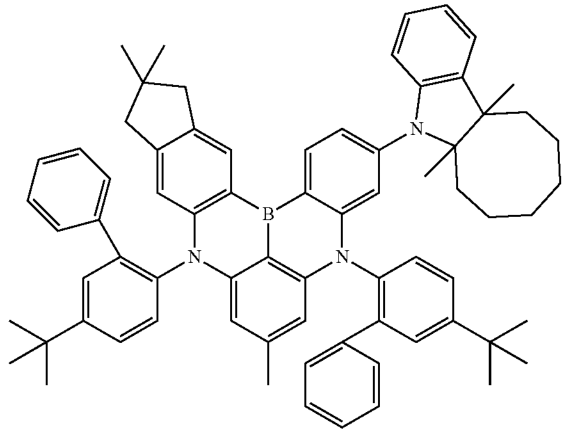
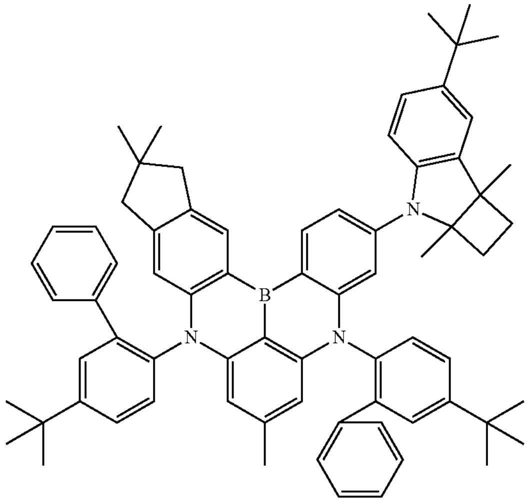

-continued
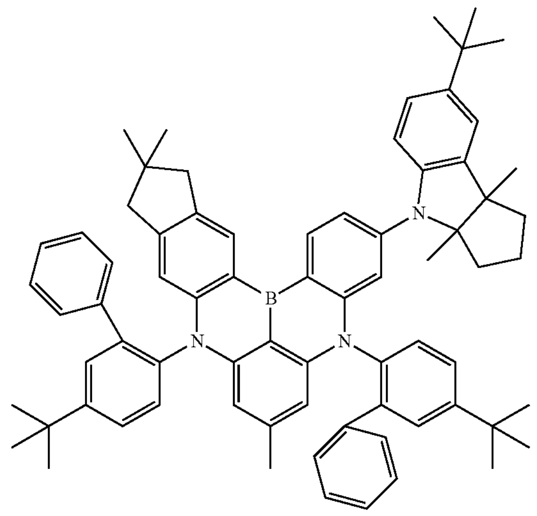
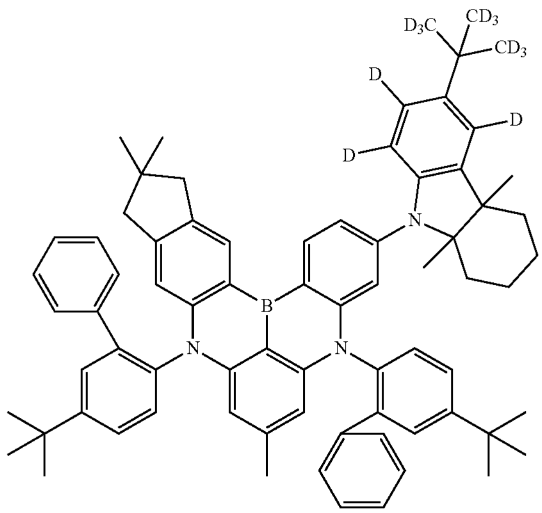
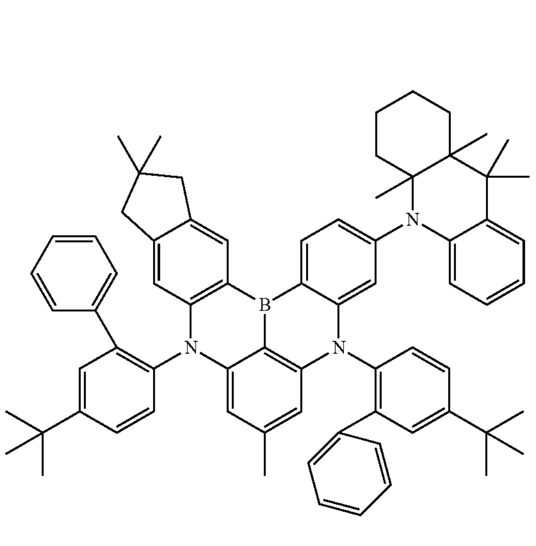
-continued
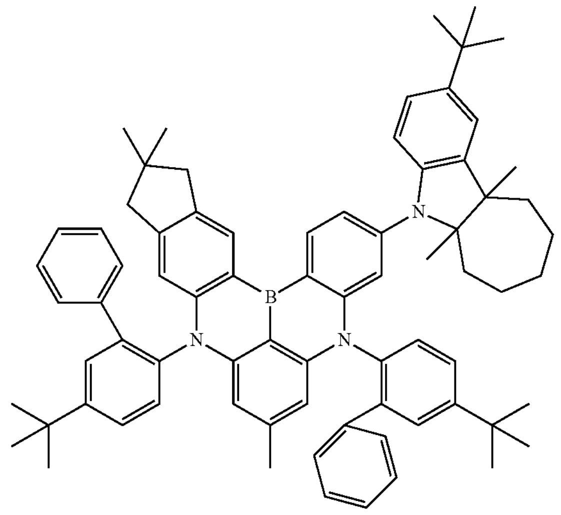
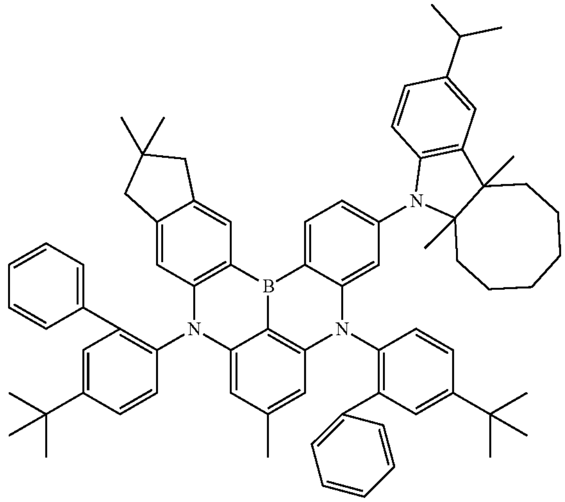
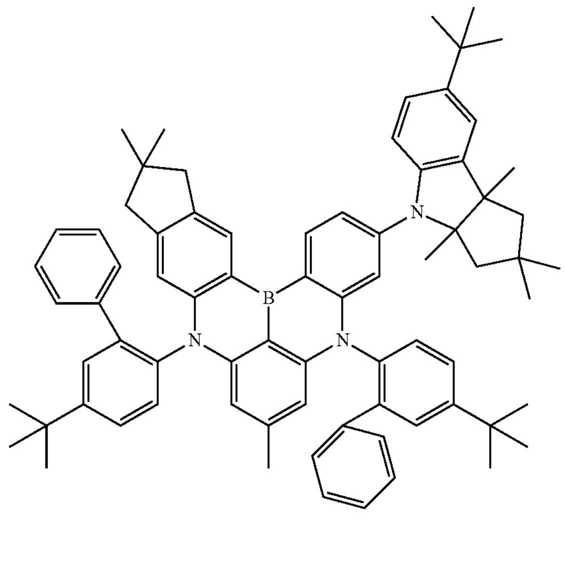

-continued
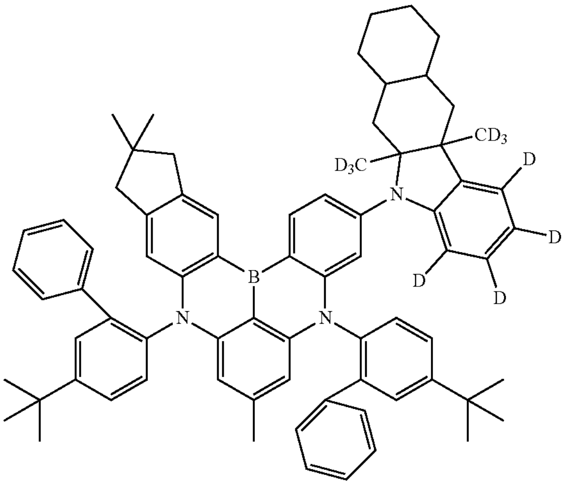
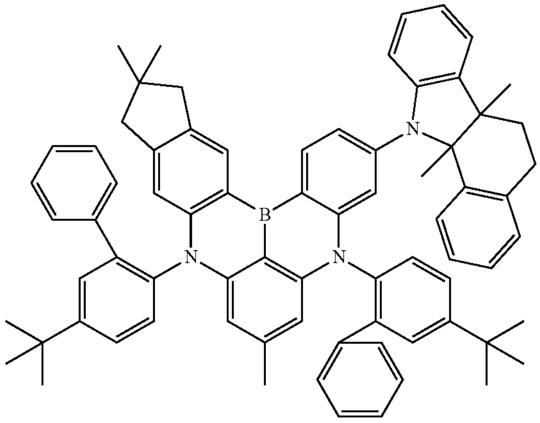
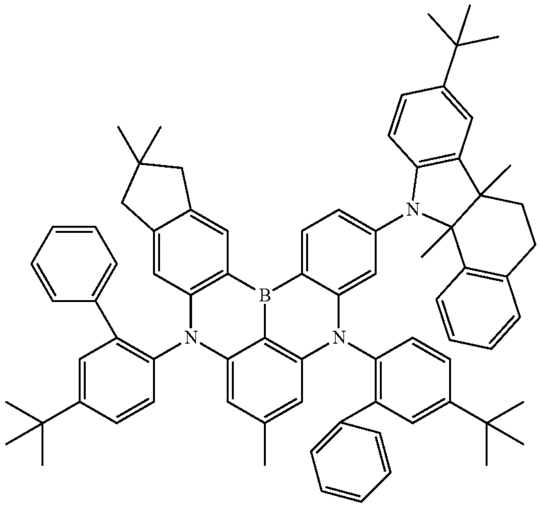
-continued
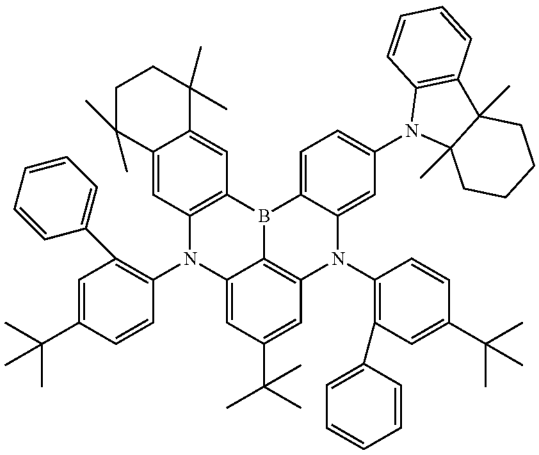
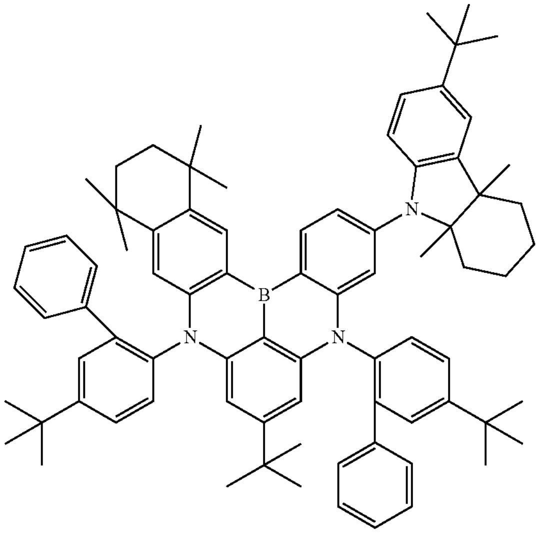
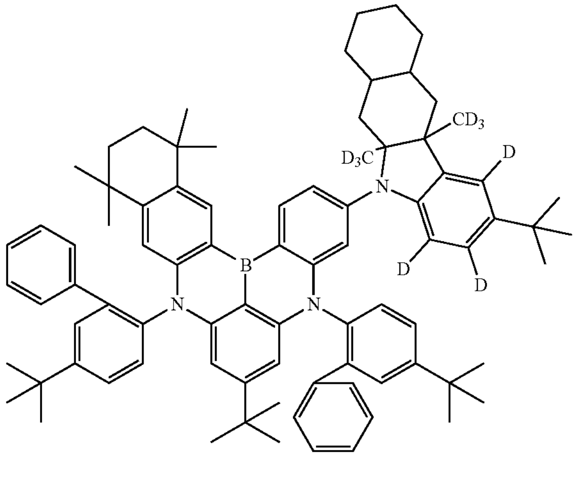

-continued
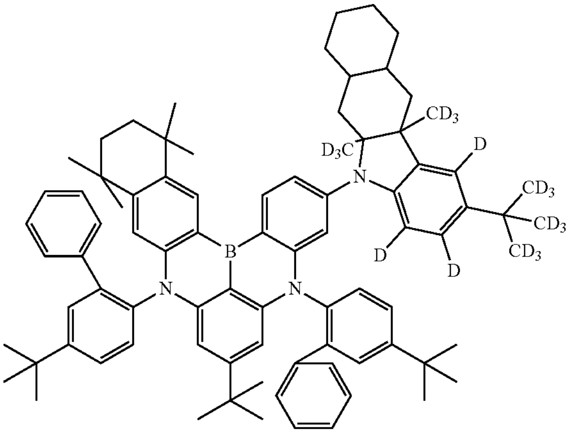
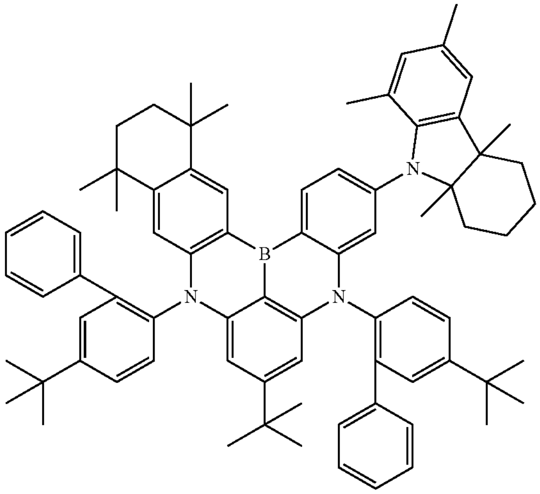
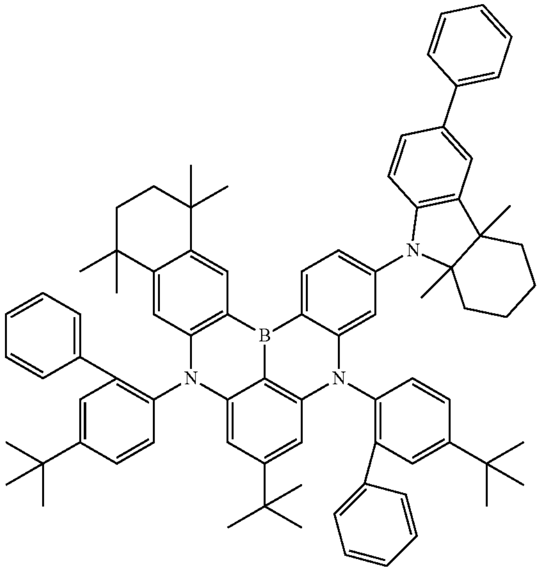
-continued
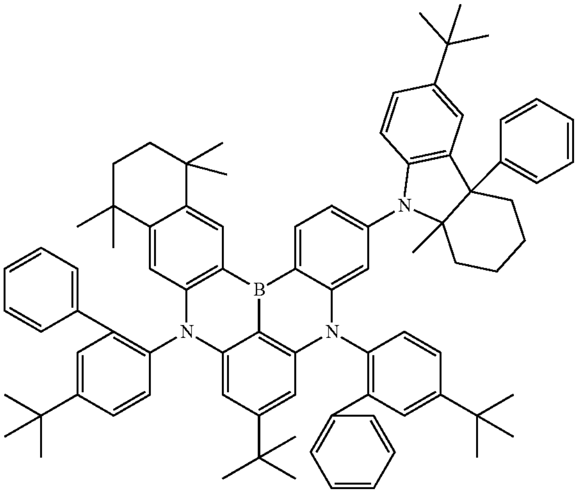
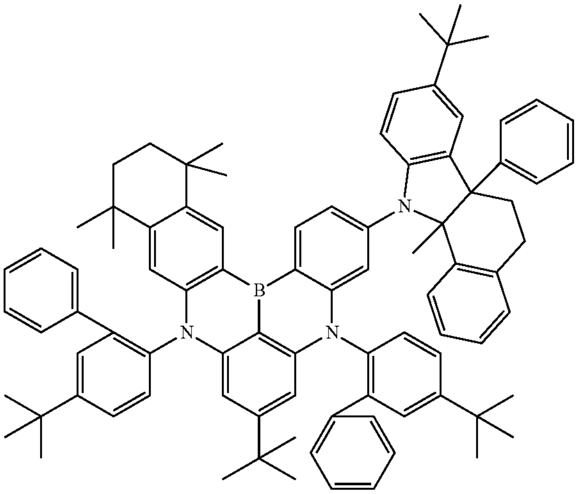
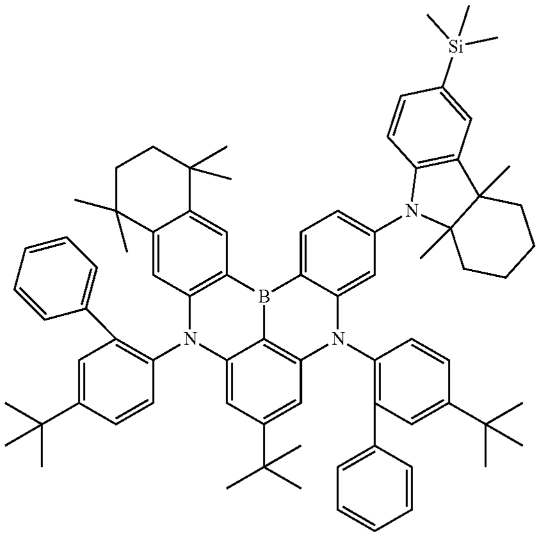

-continued
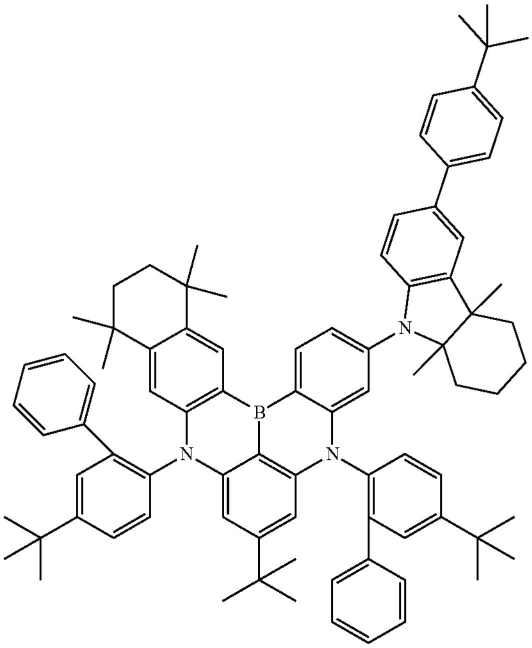
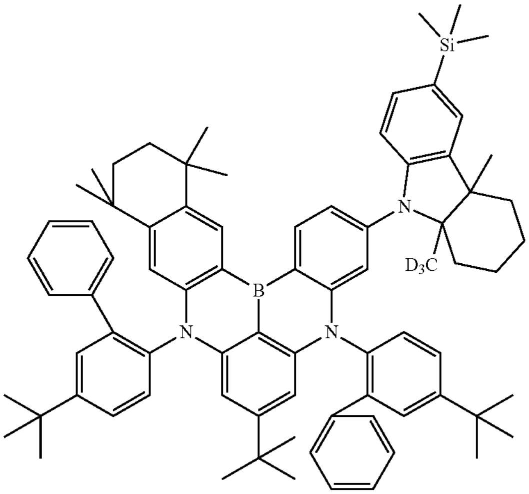
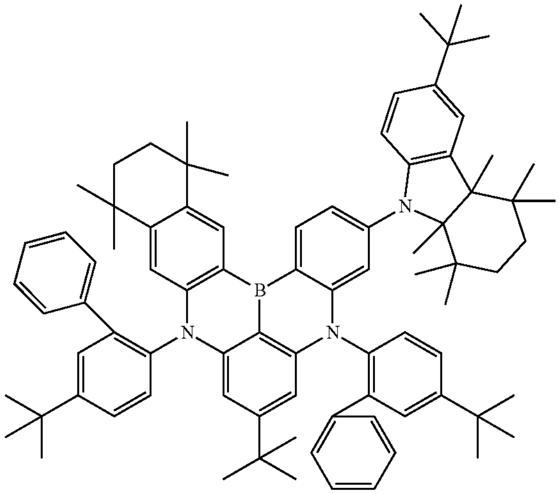
-continued
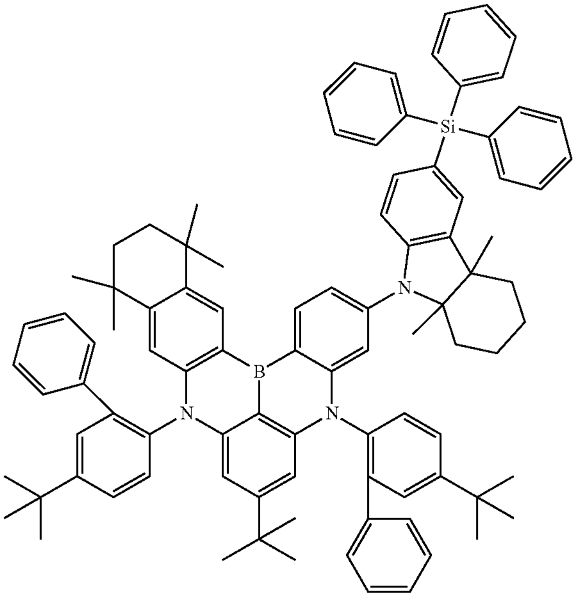
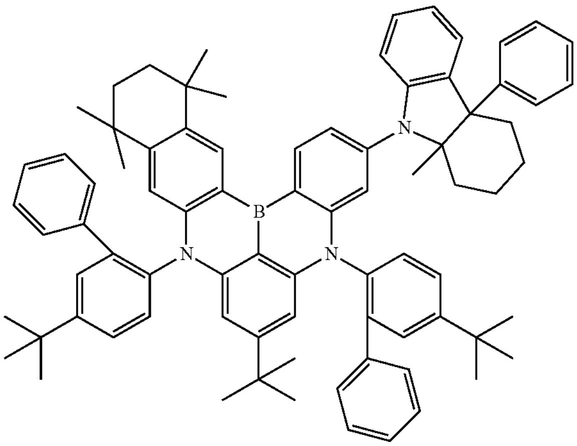
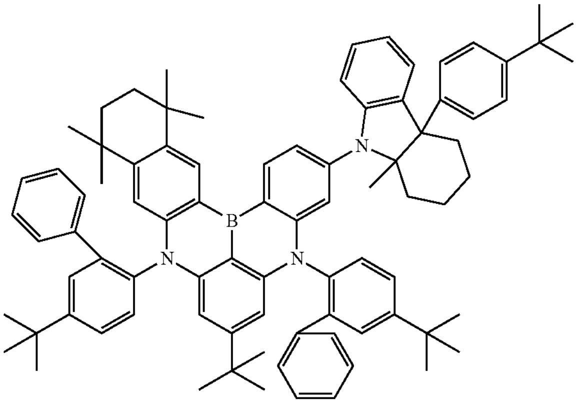

-continued
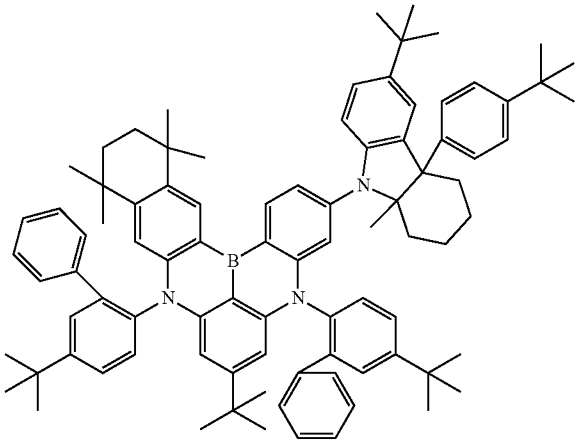
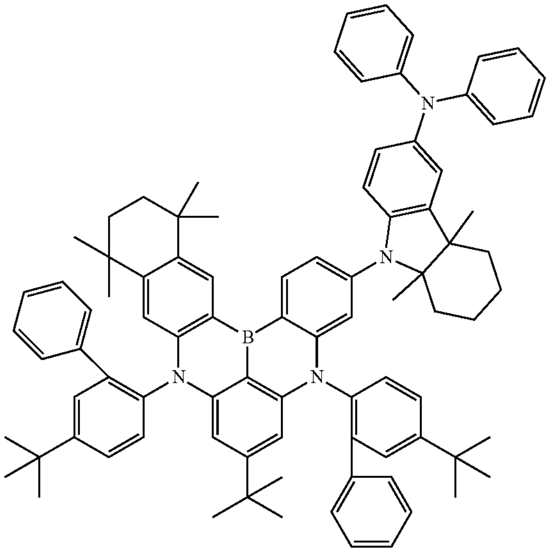
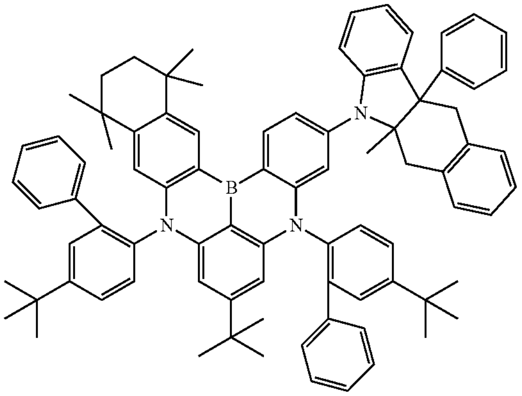
-continued
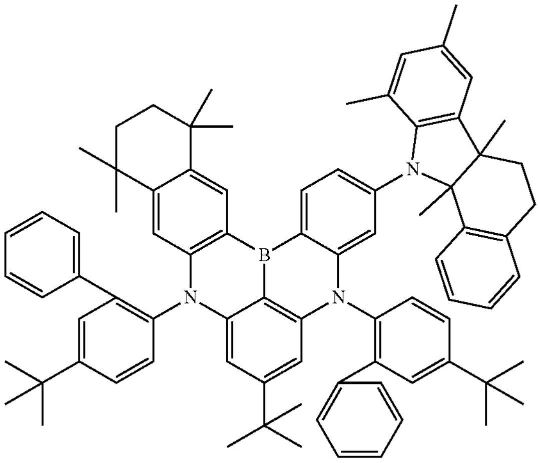
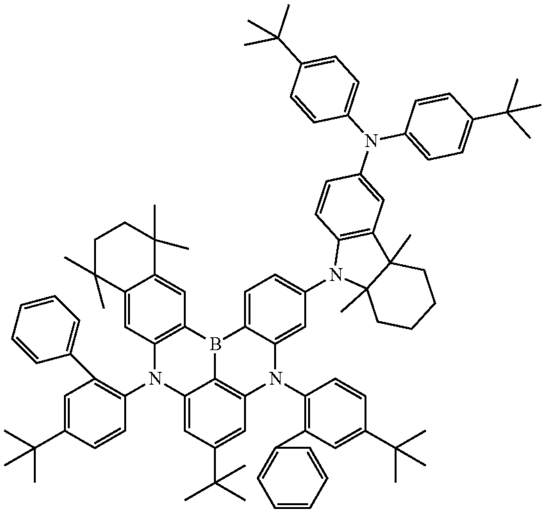
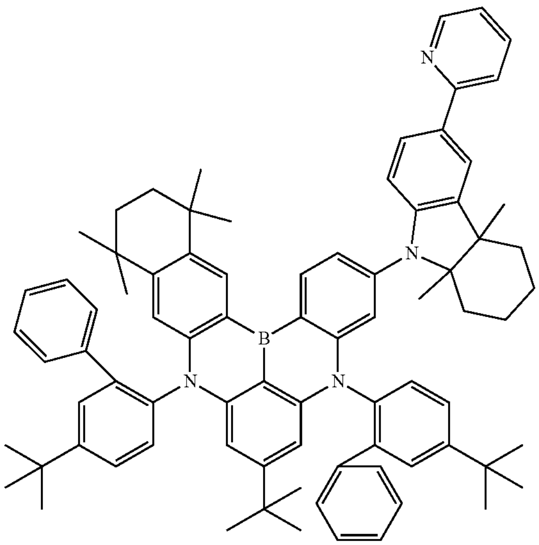

-continued
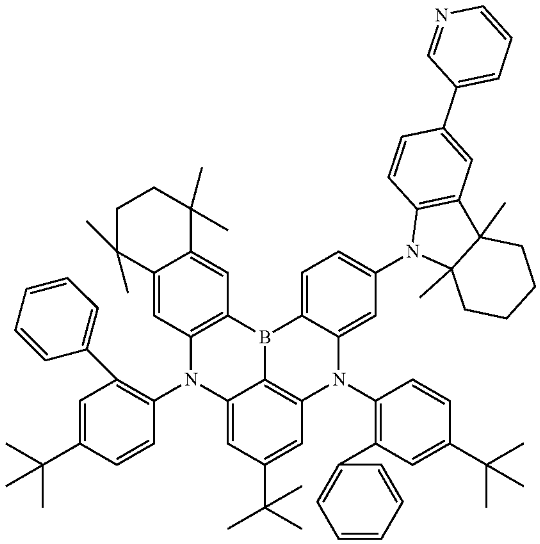
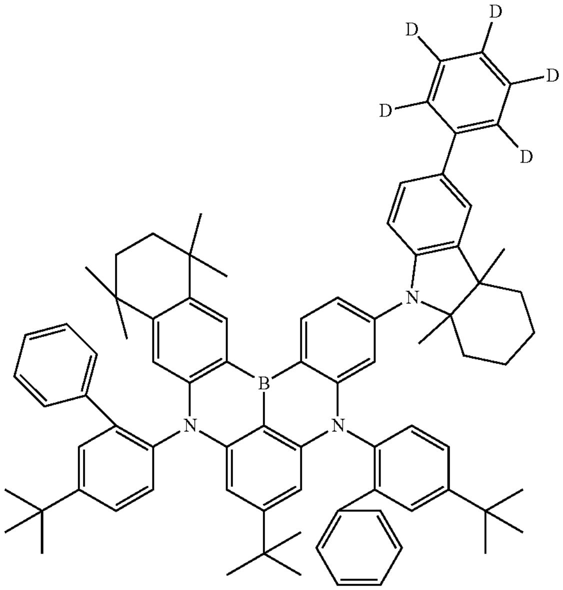
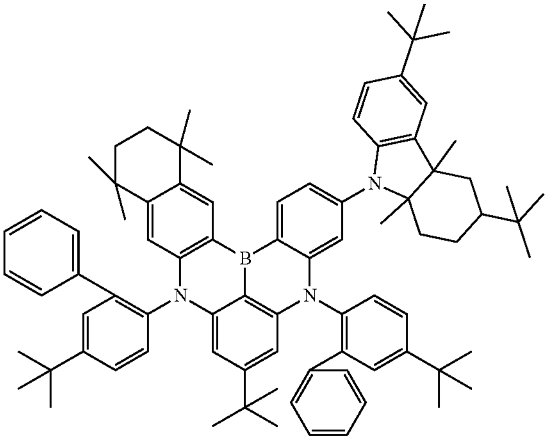
-continued
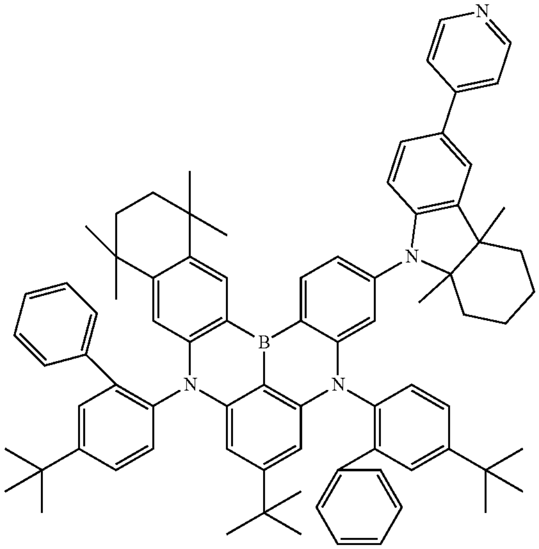
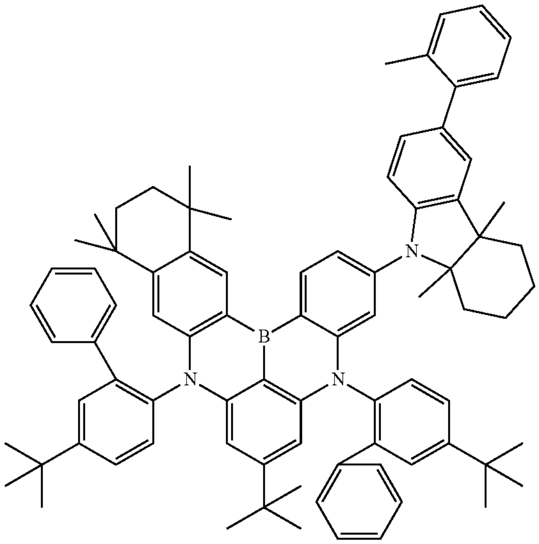
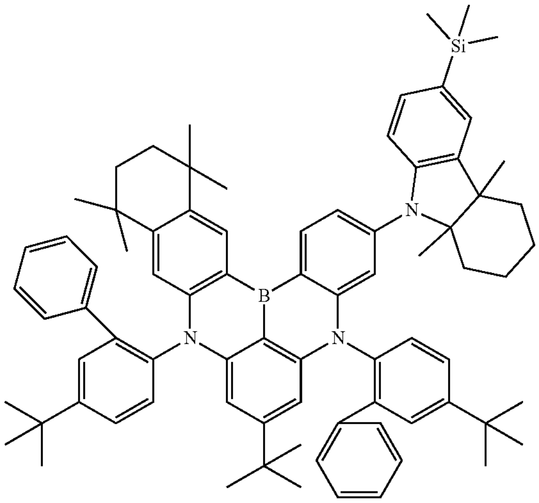

-continued
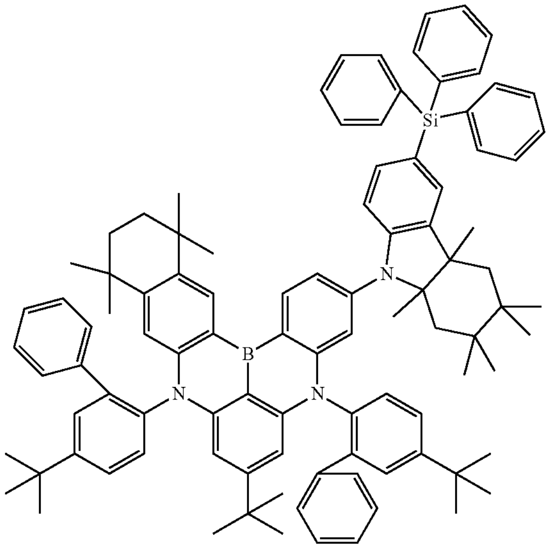
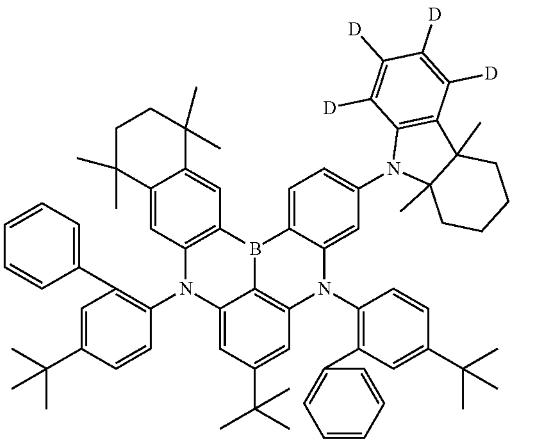
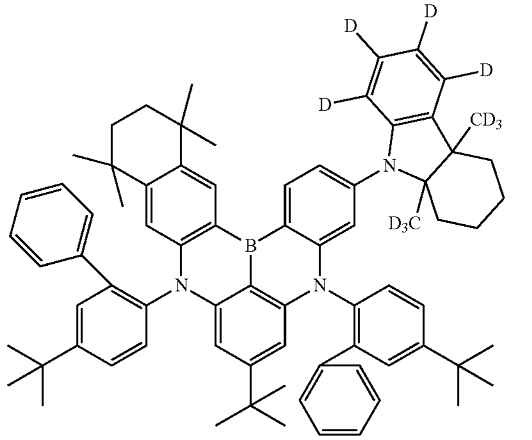
-continued
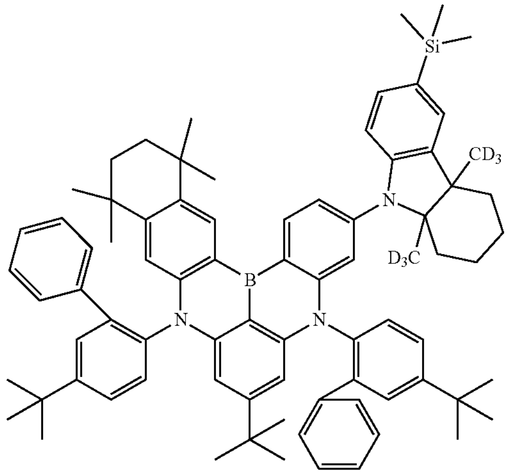
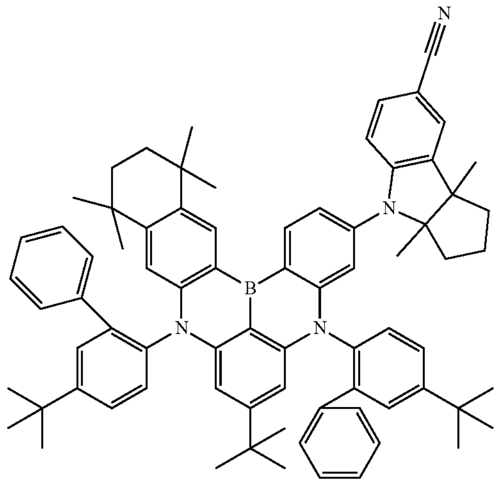
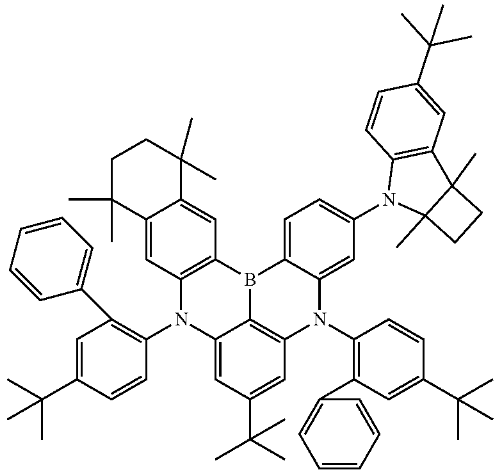

-continued
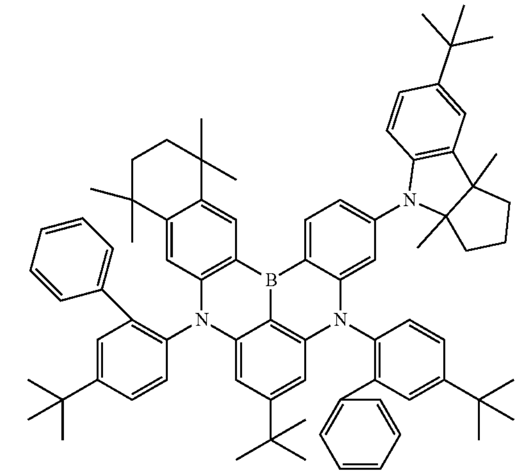
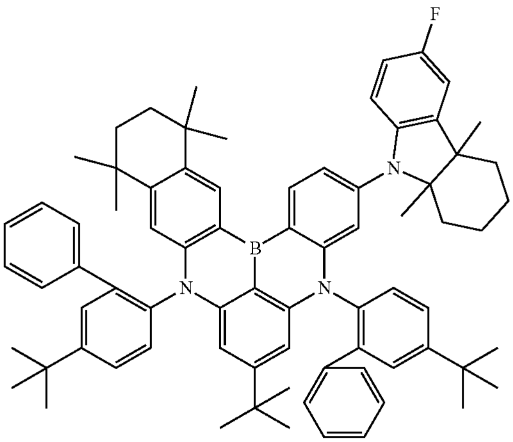
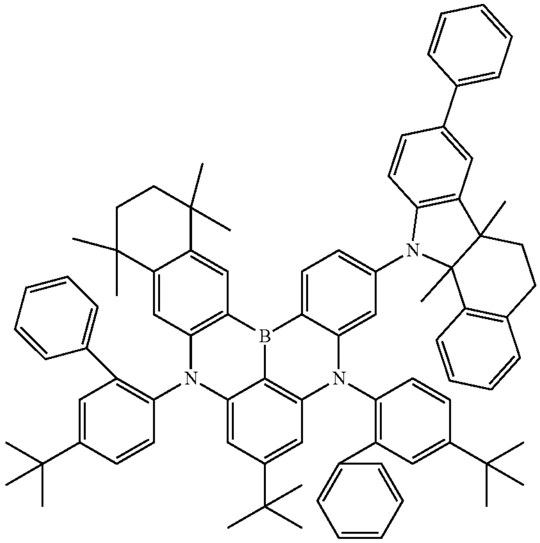
-continued
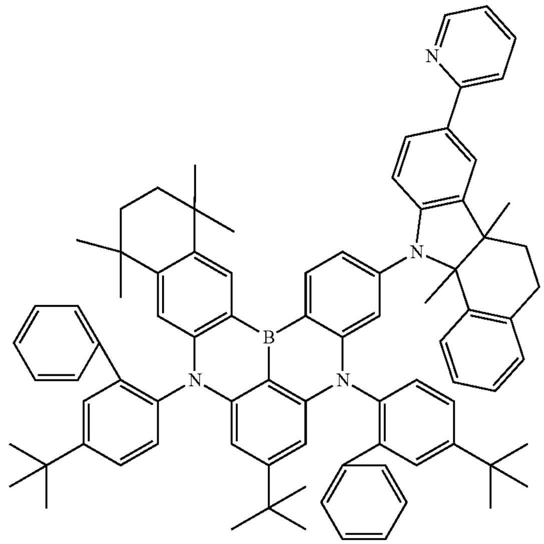
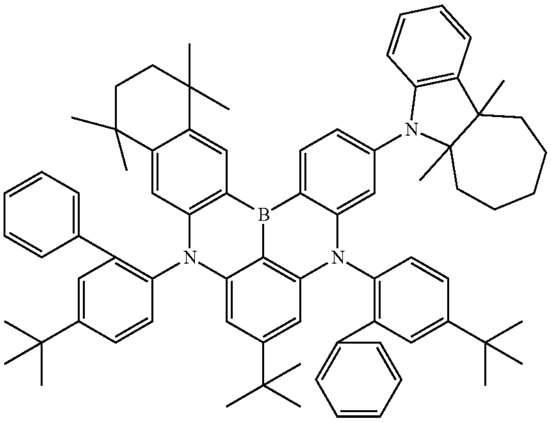
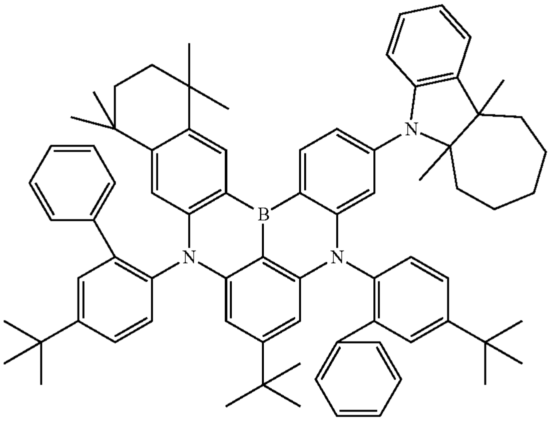

-continued
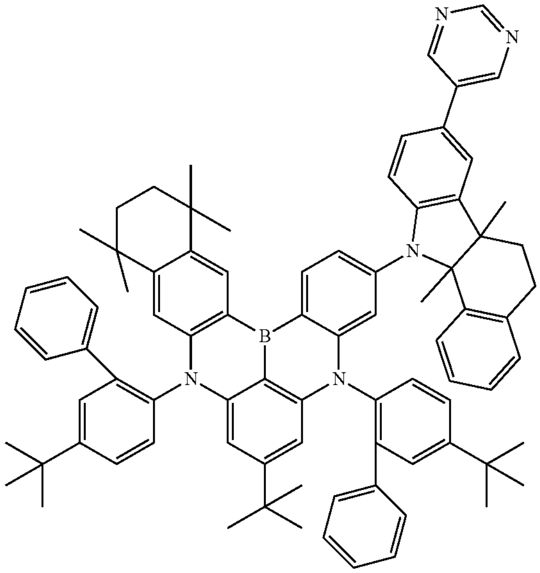
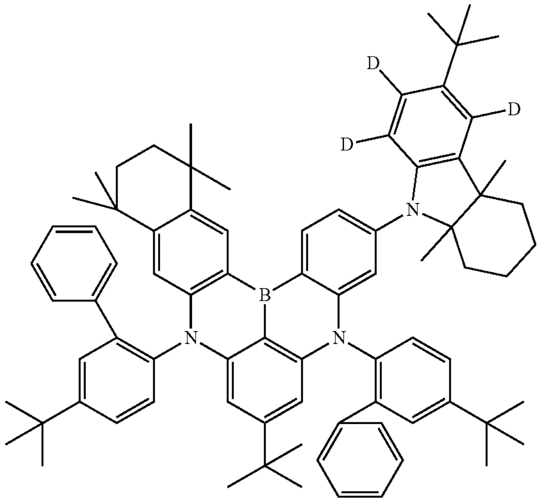
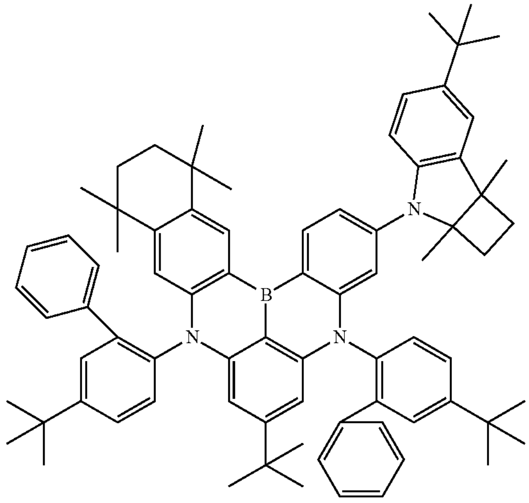
-continued
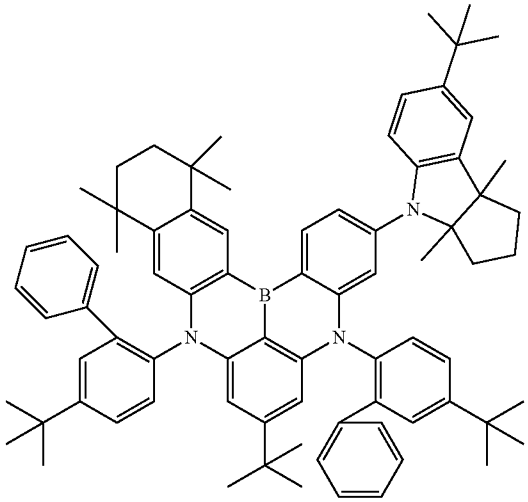
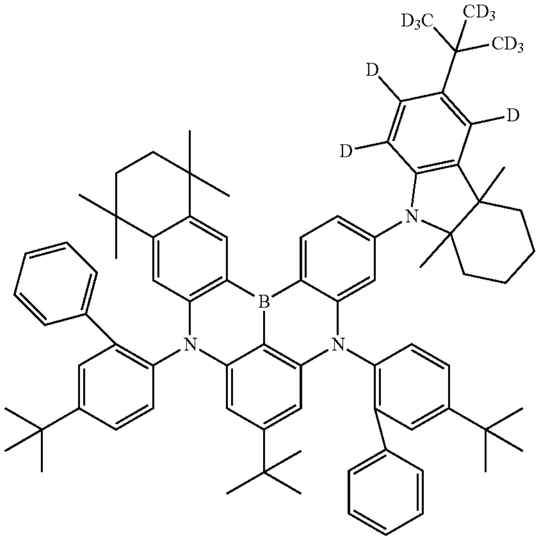
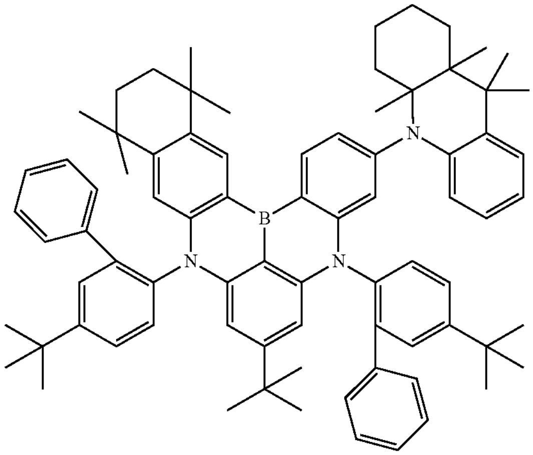

-continued
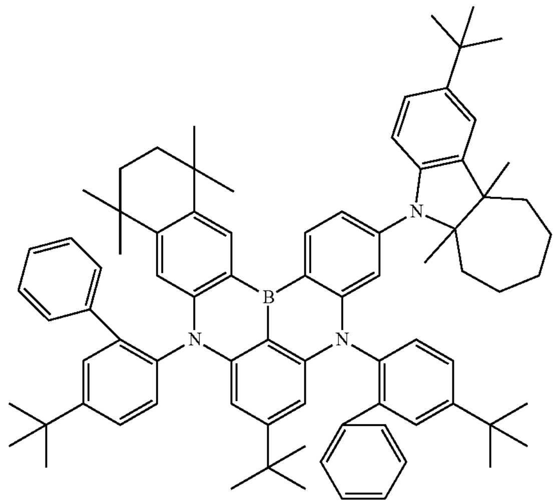
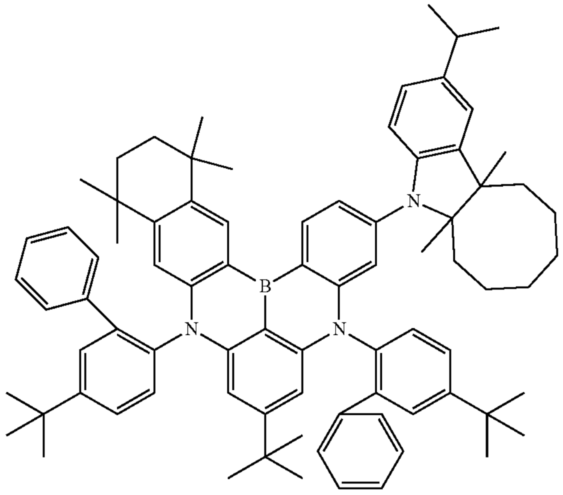
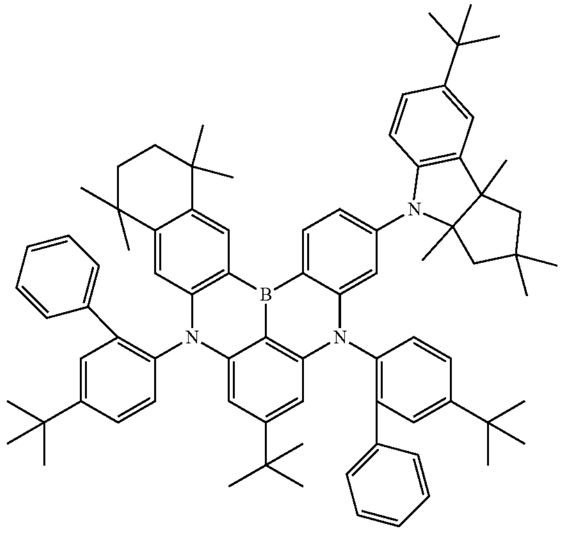
-continued
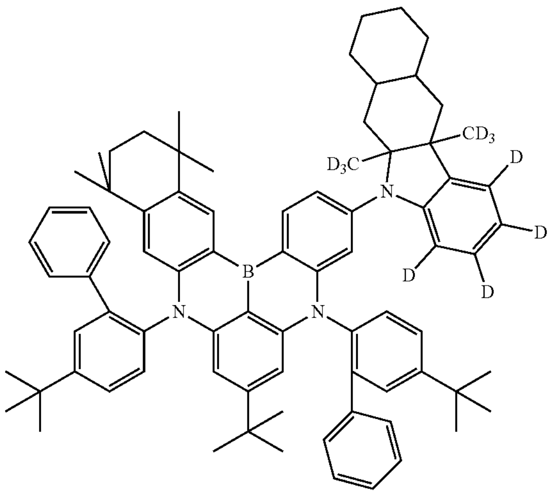
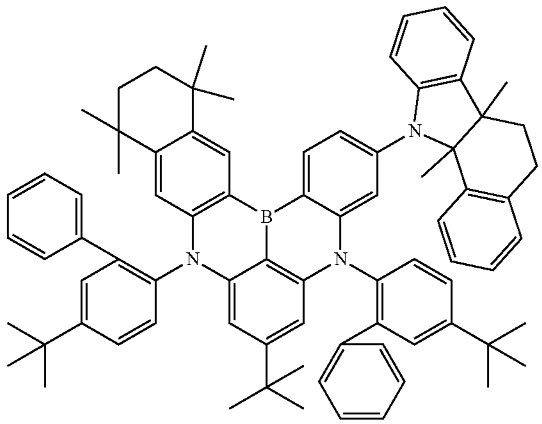
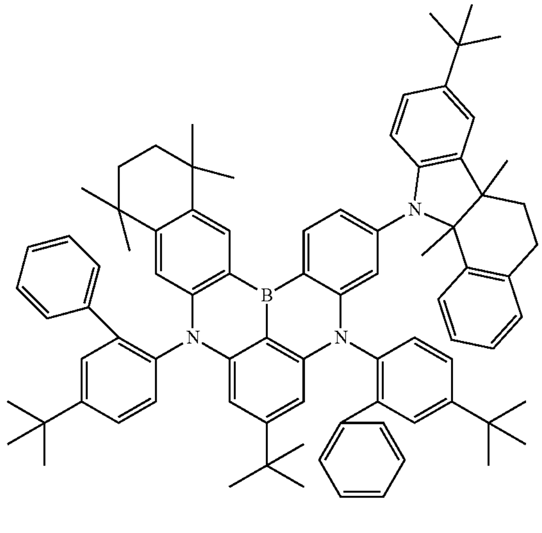

-continued
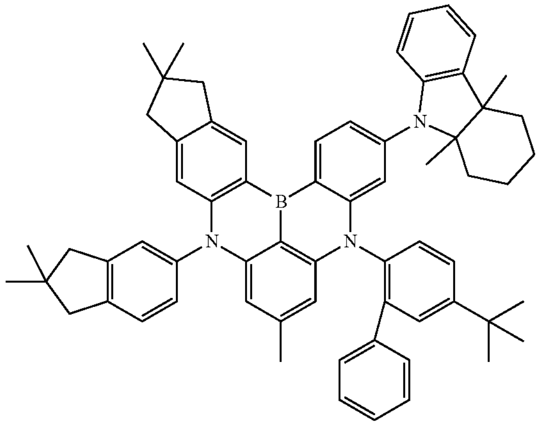
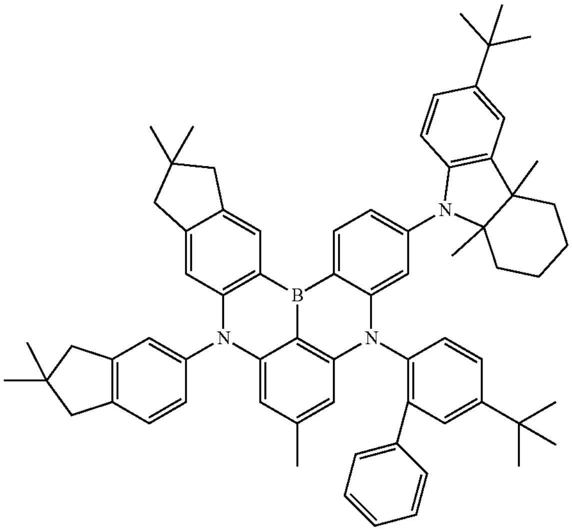
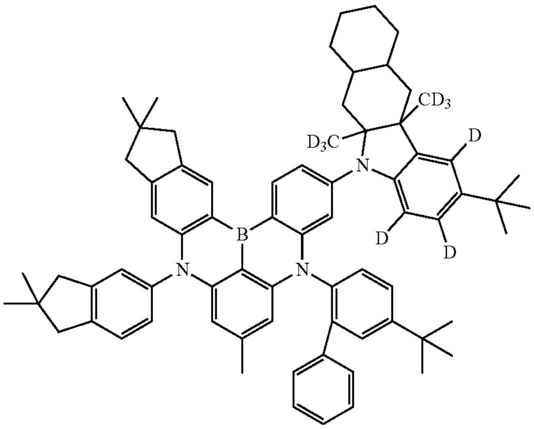
-continued
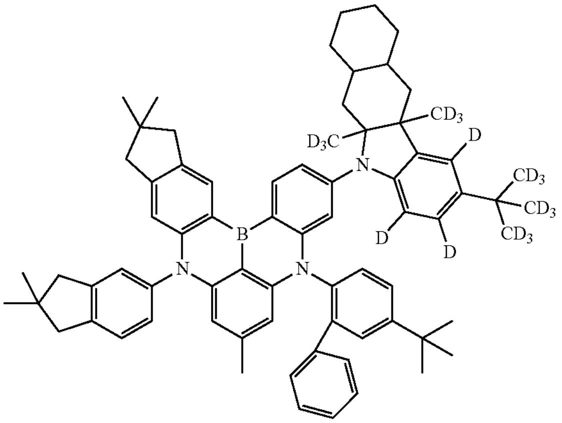
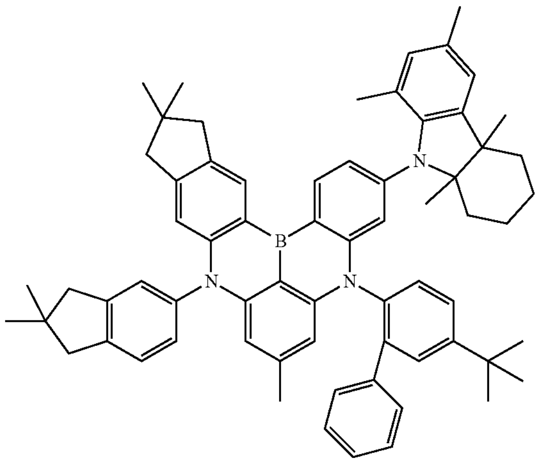
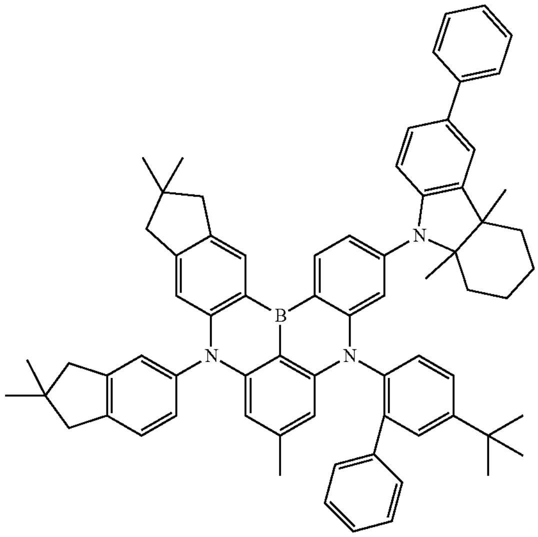

-continued
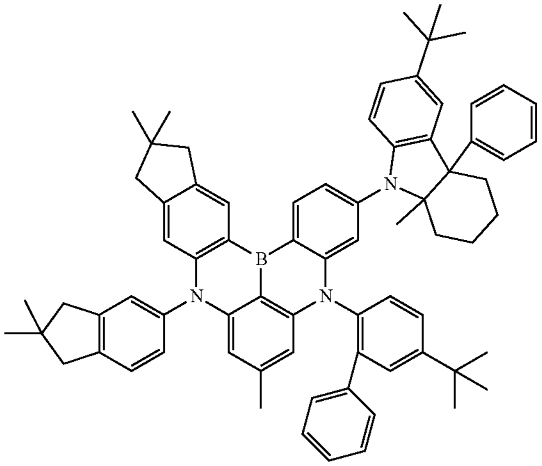
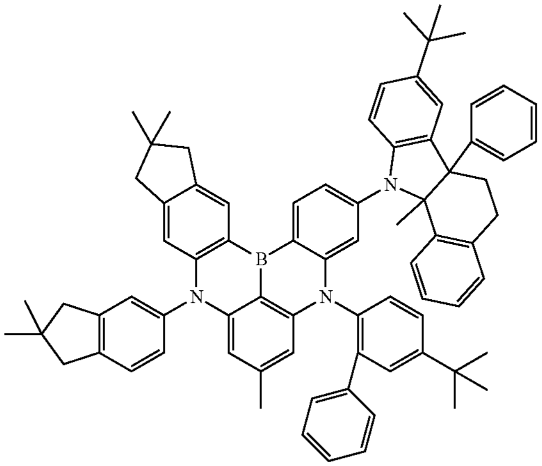
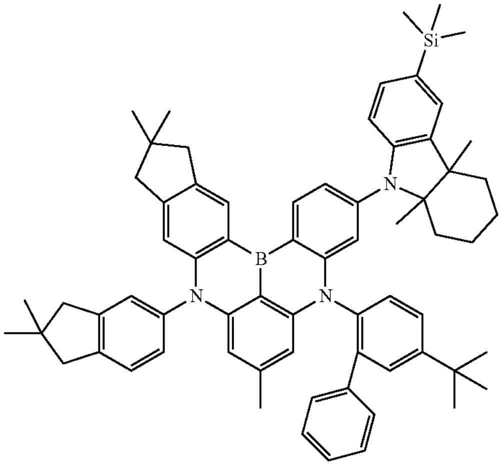
-continued
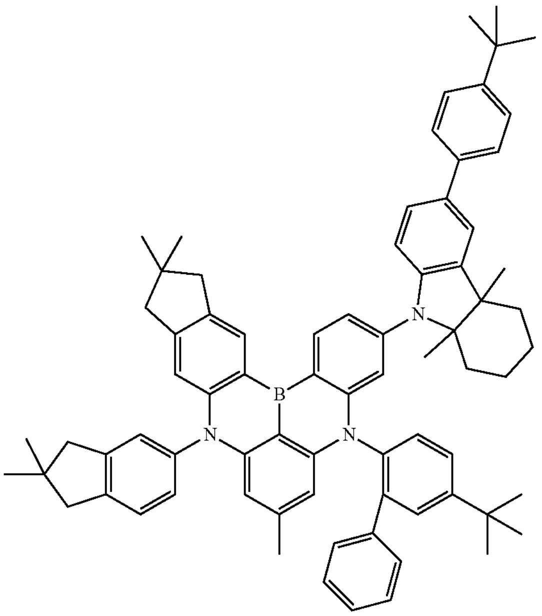
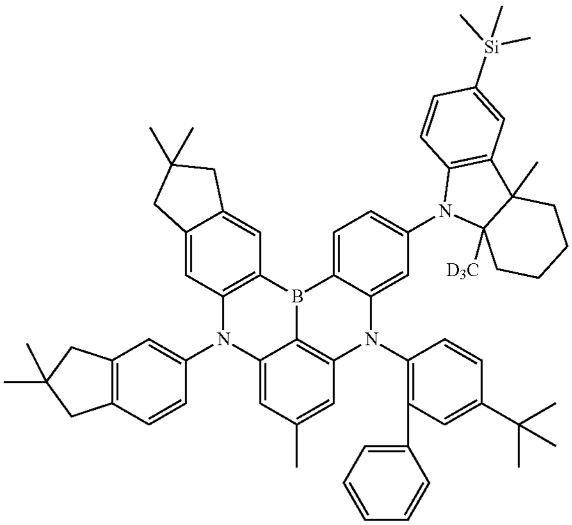
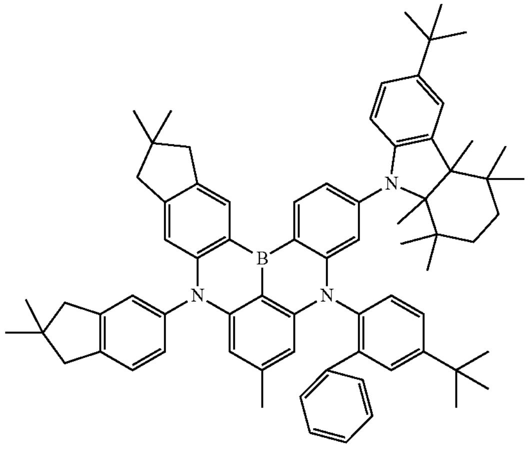

-continued
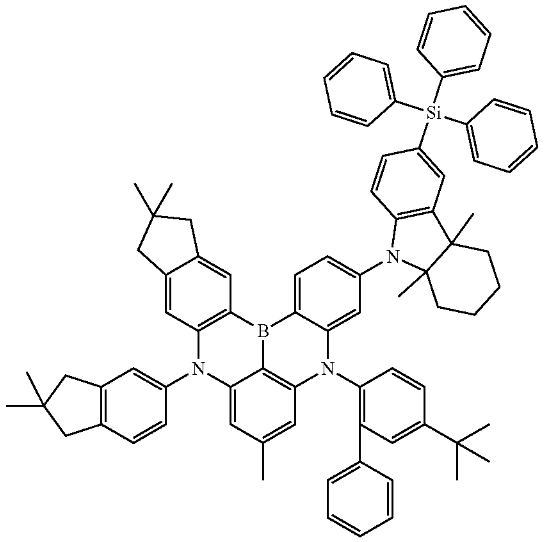
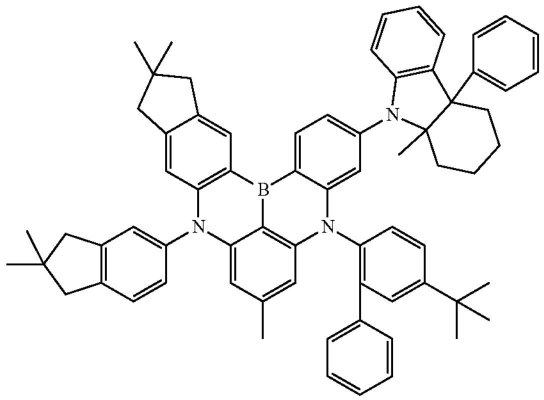
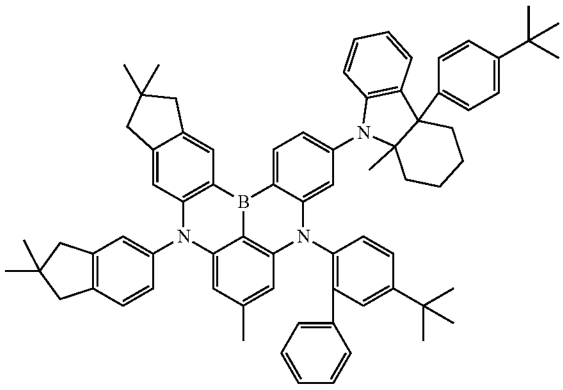
-continued
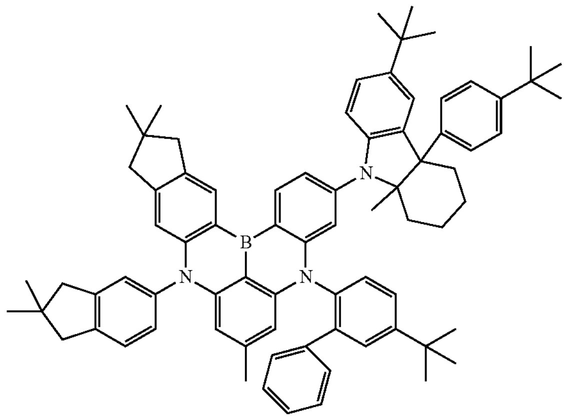
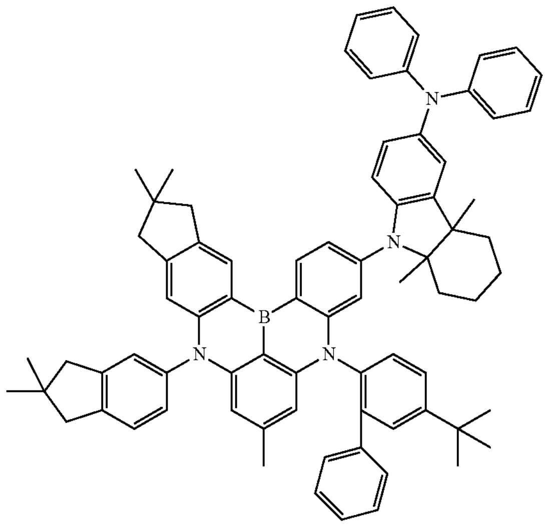
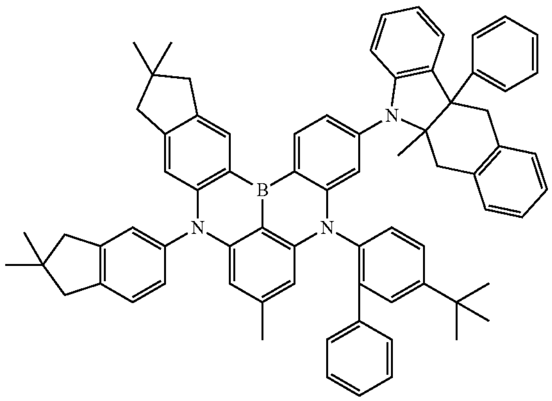

-continued
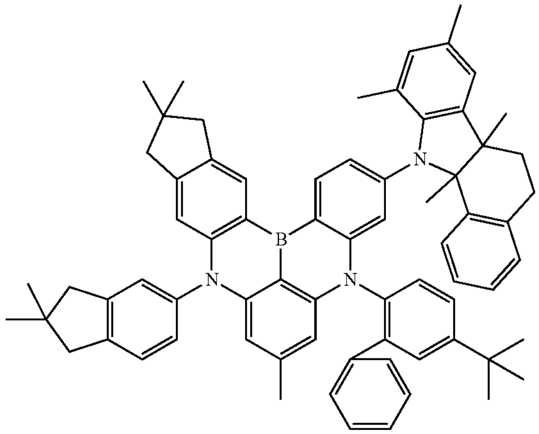
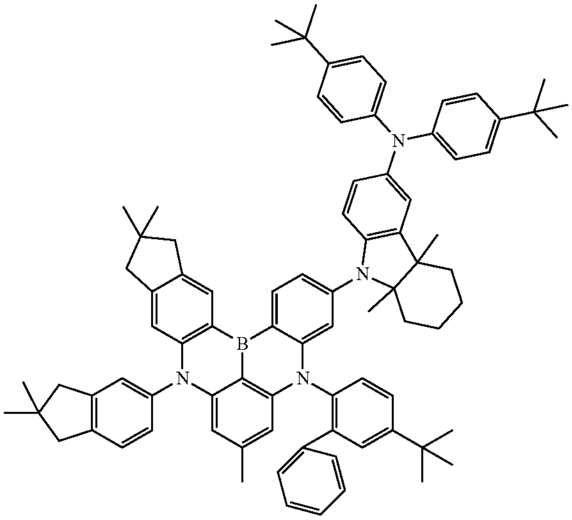
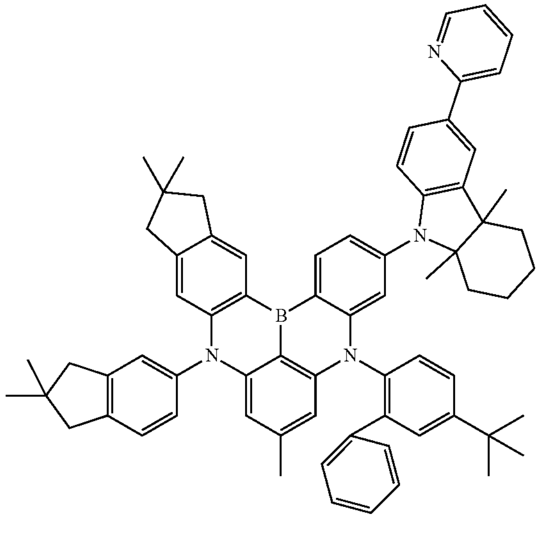
-continued
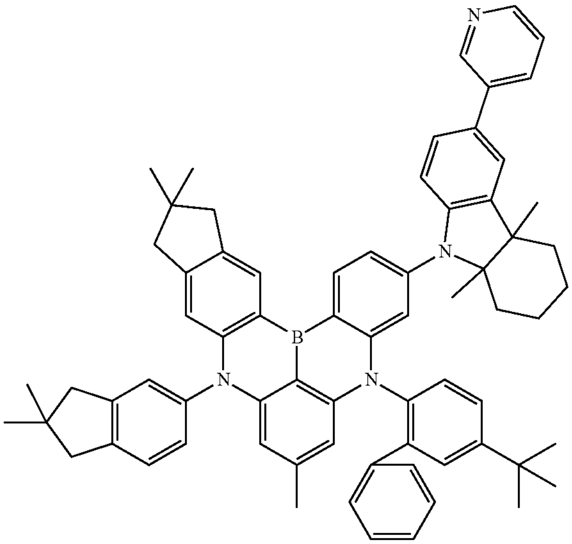
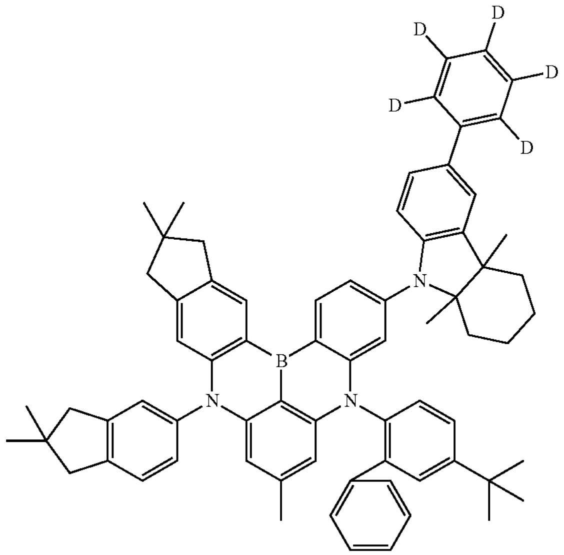
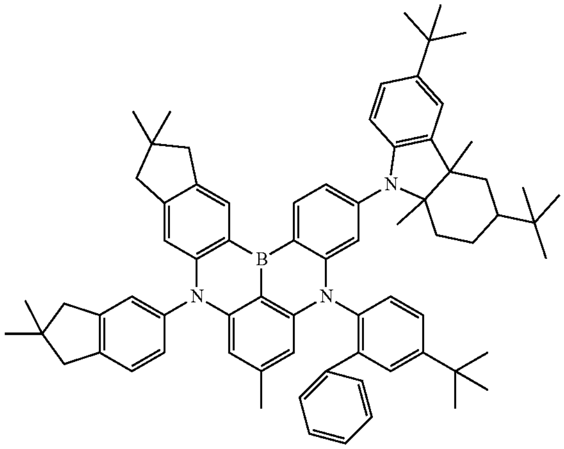

-continued
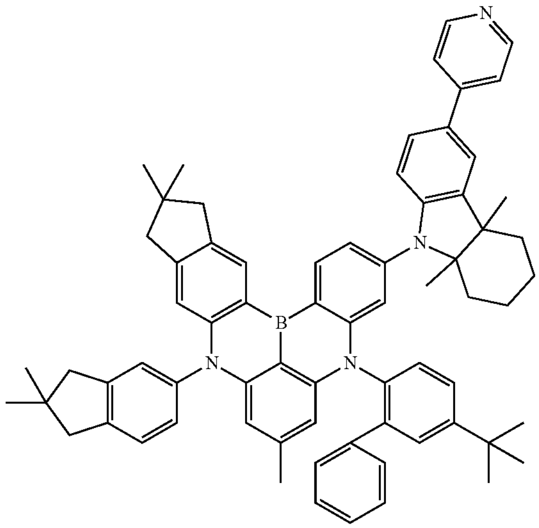
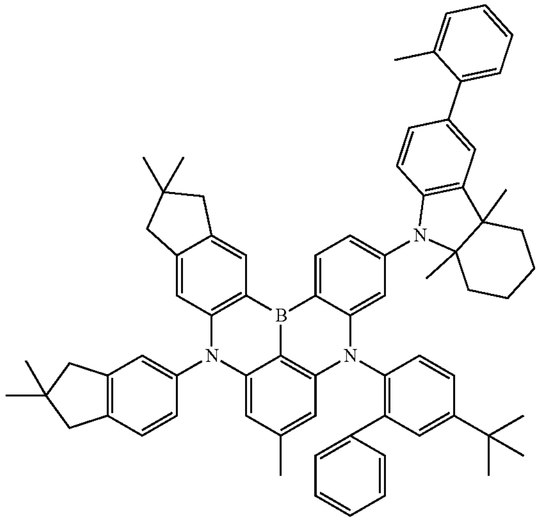
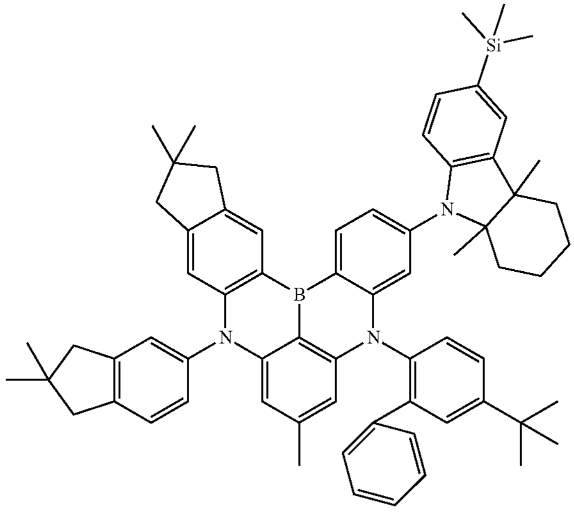
-continued
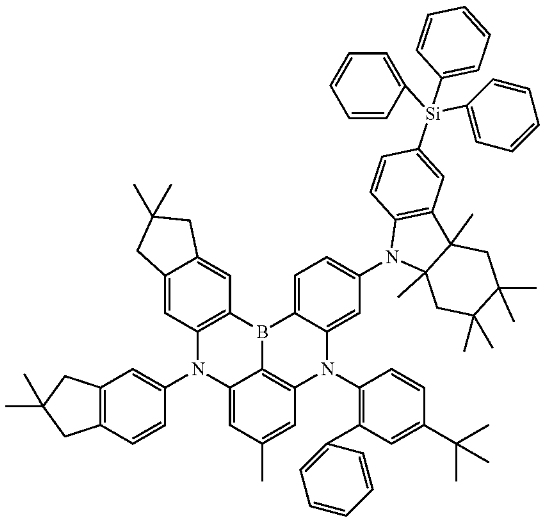
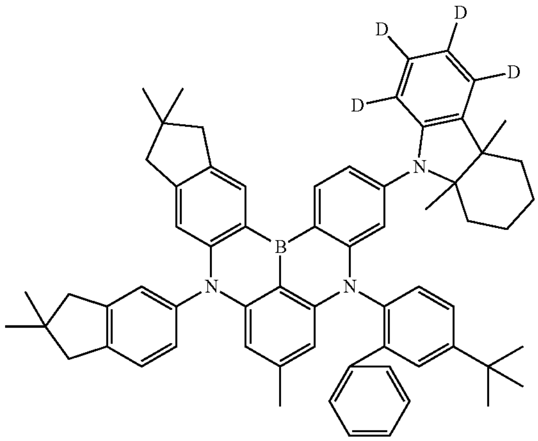
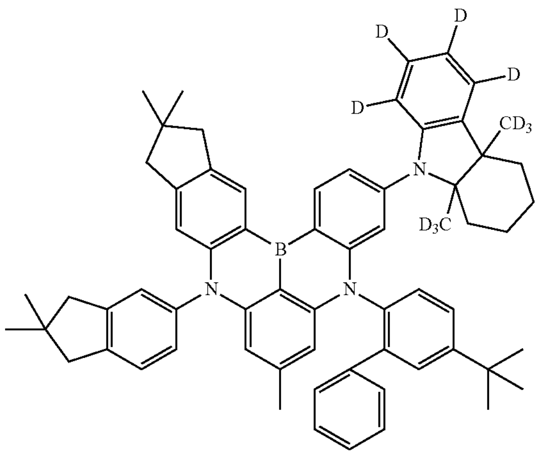

-continued
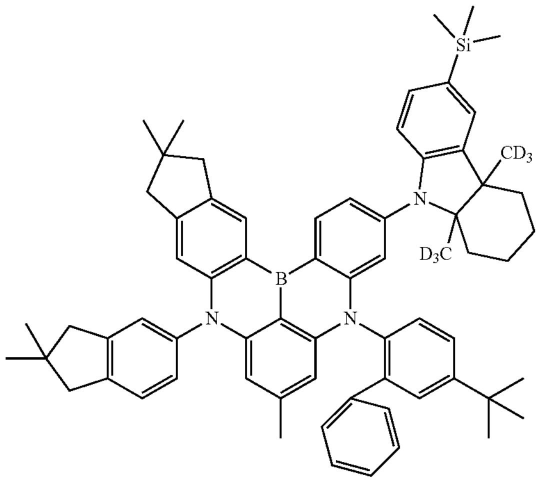
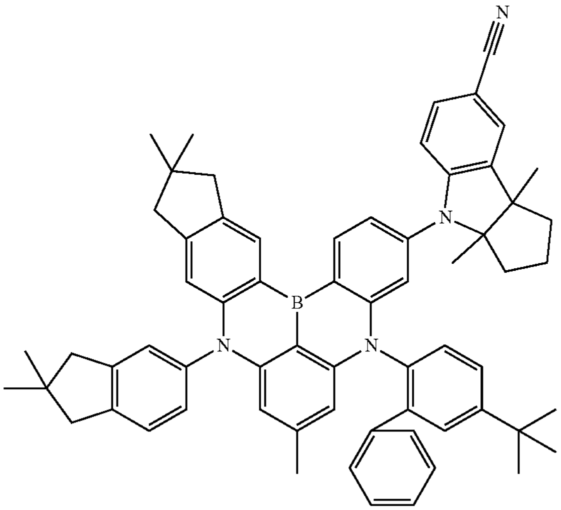
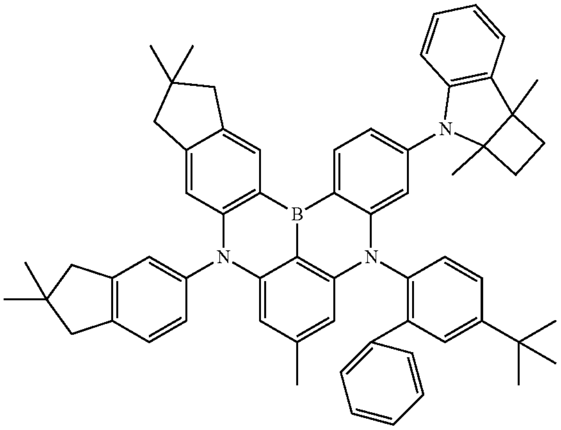
-continued
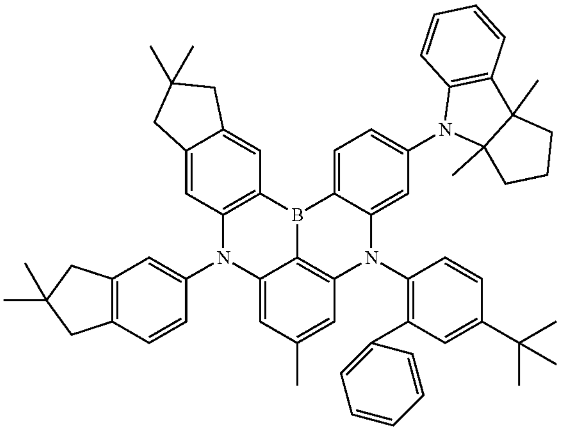
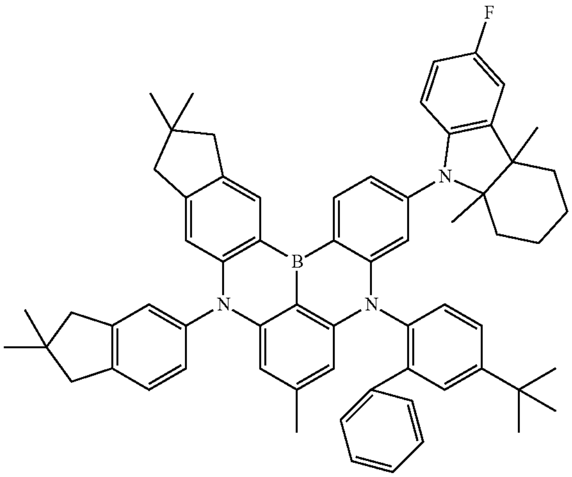
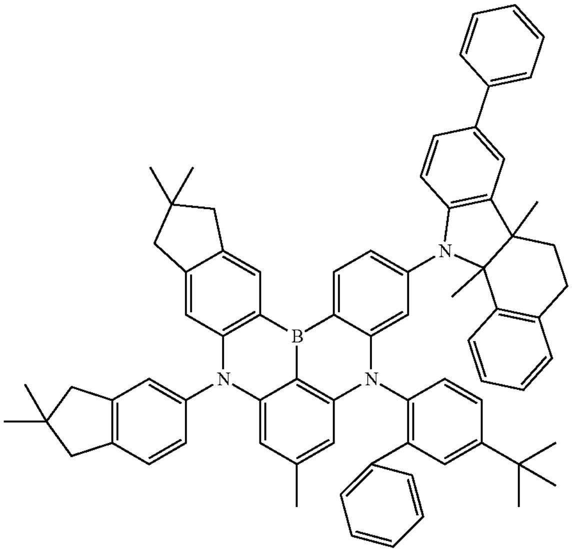

-continued
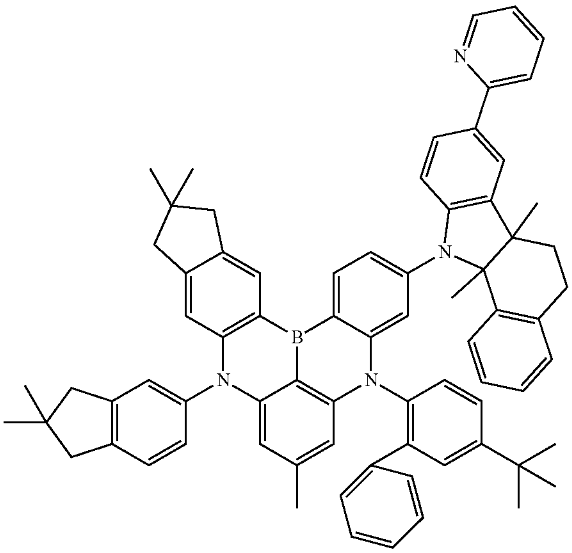
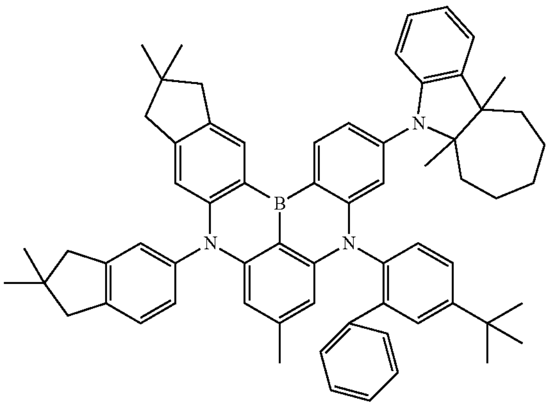
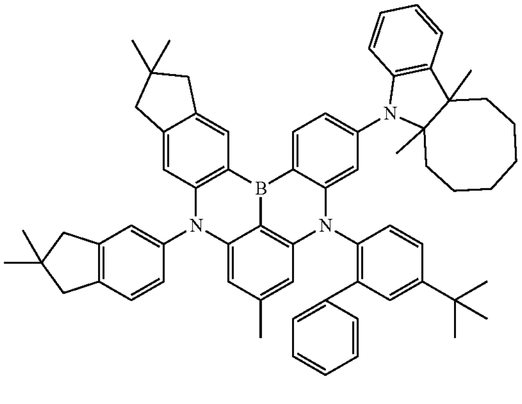
-continued
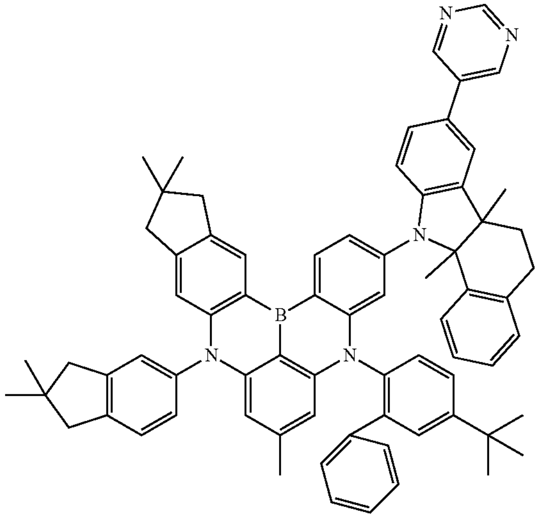
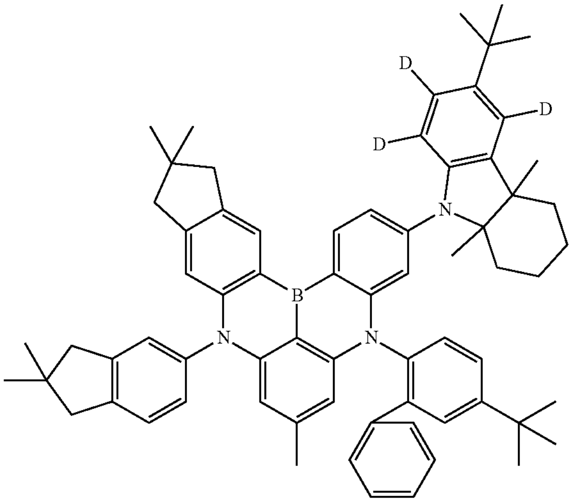
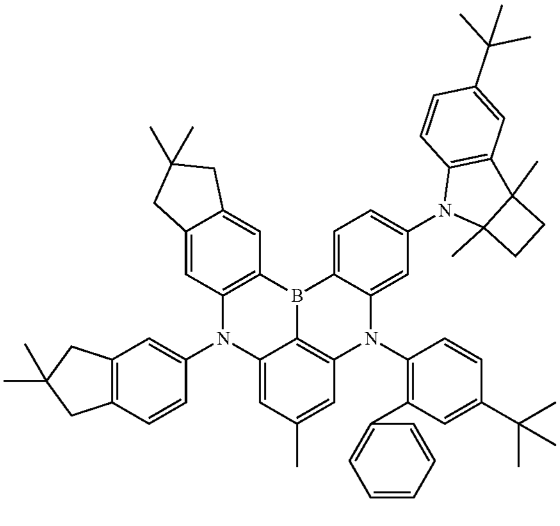

-continued
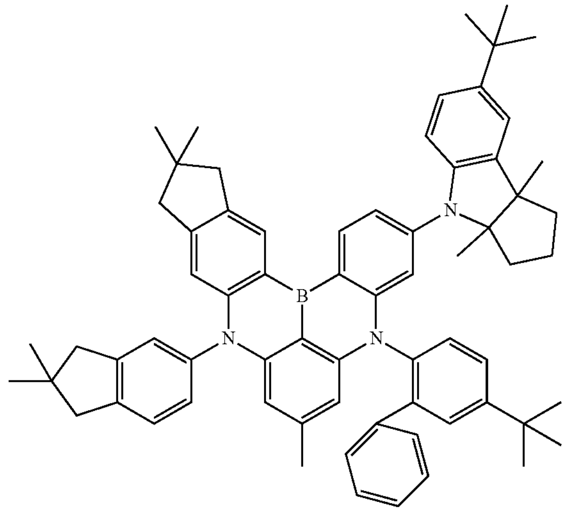
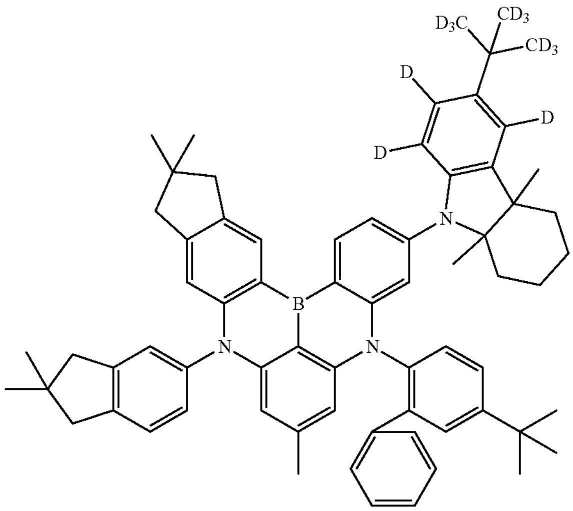
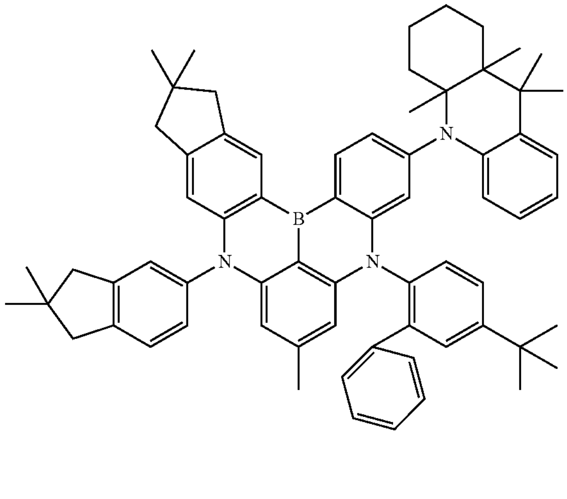
-continued
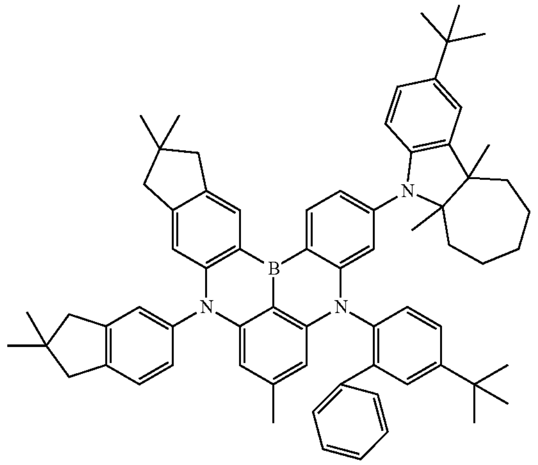
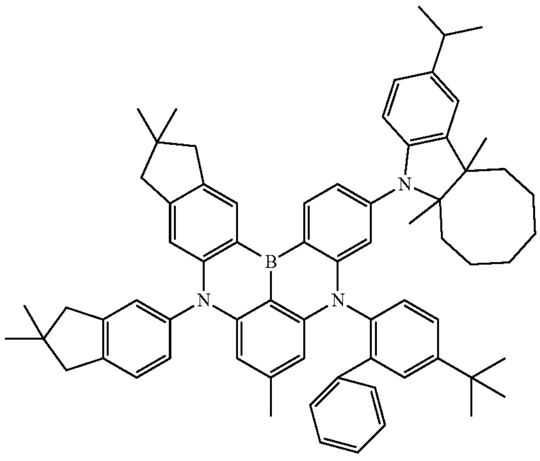
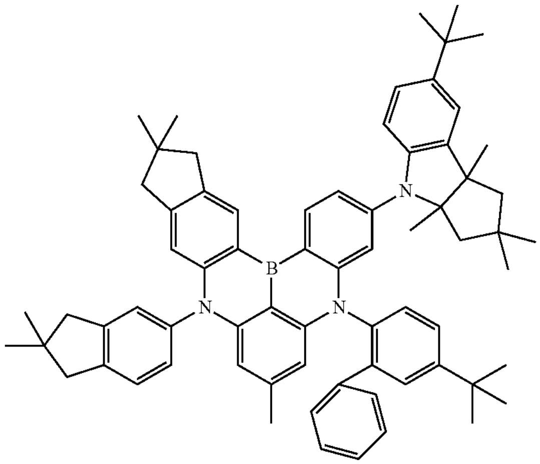

-continued
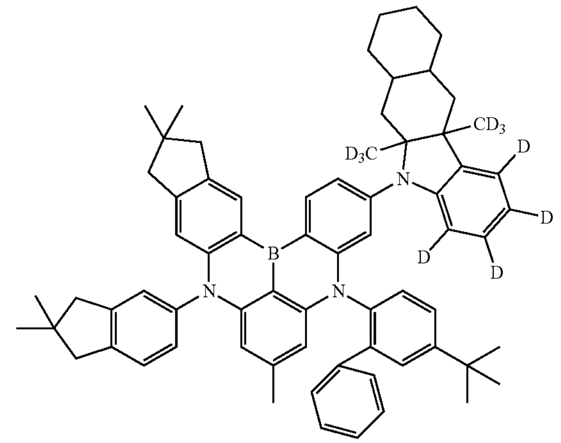
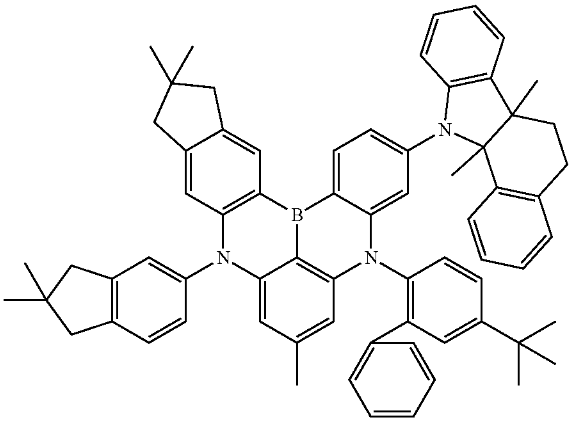
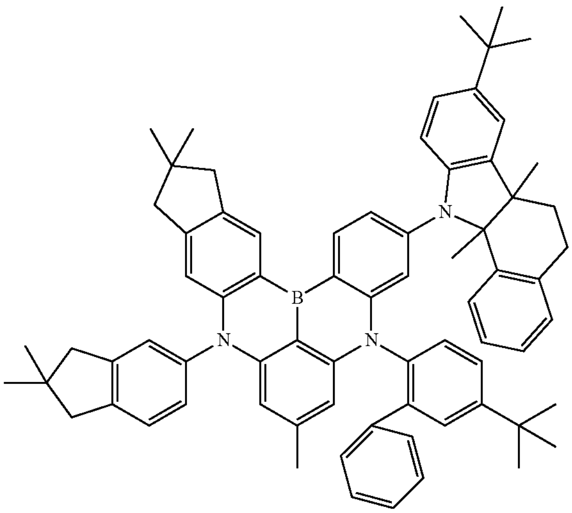
-continued
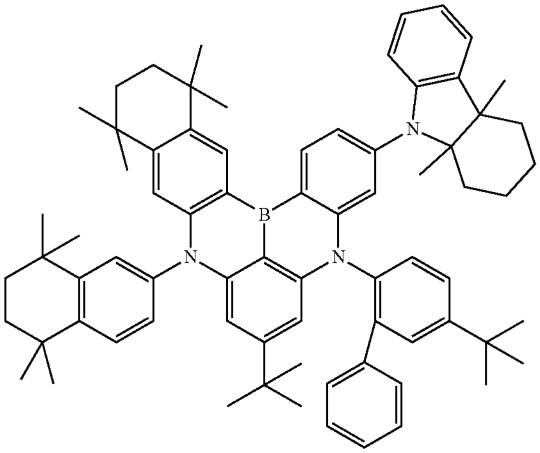
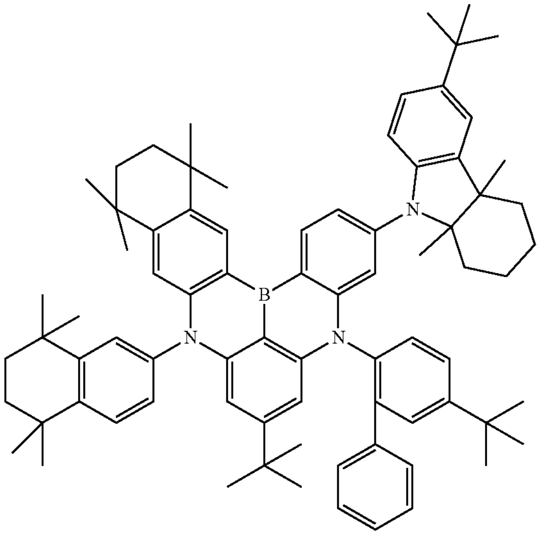
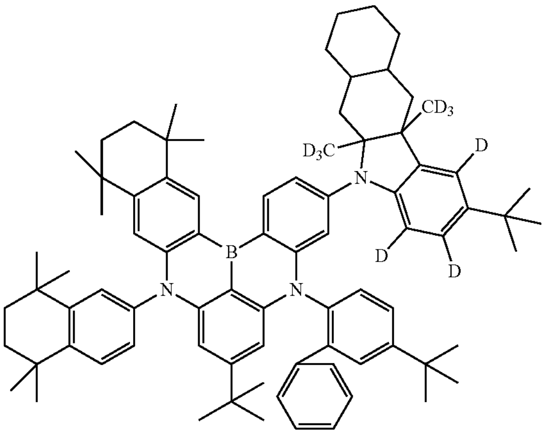

-continued
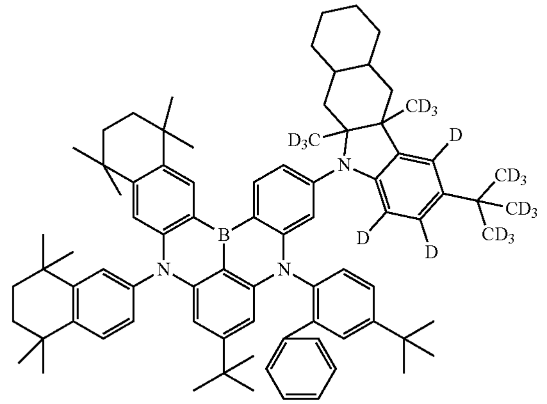
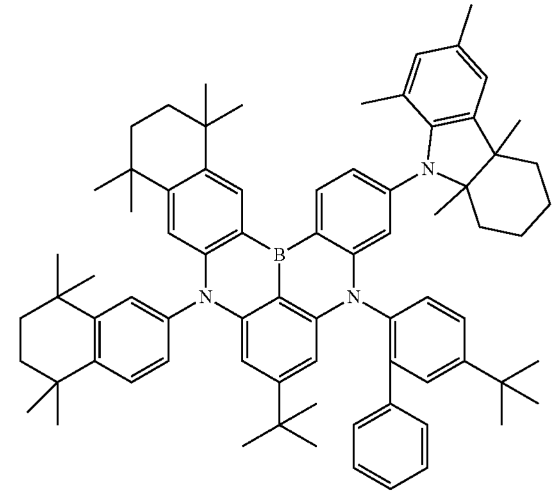
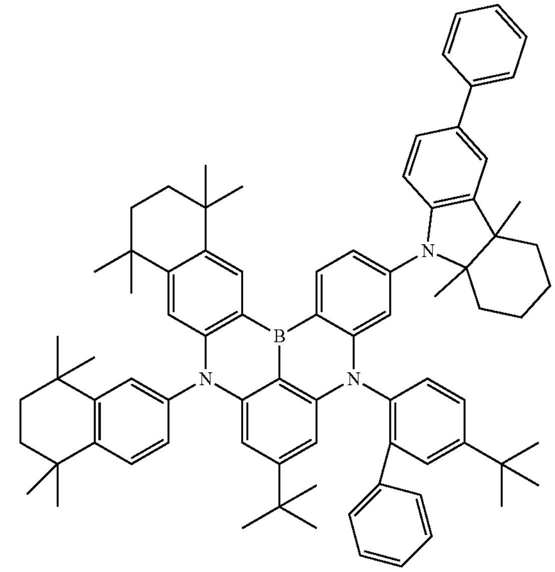
-continued
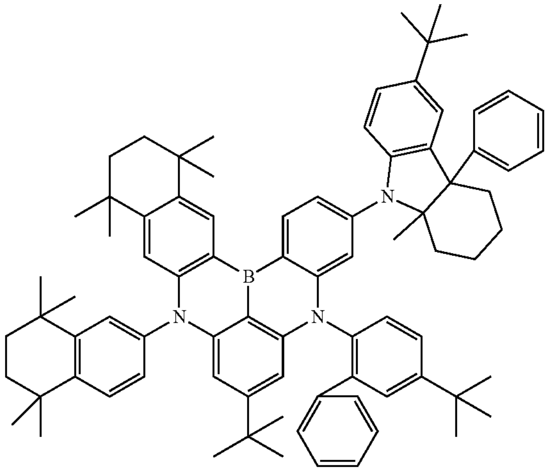
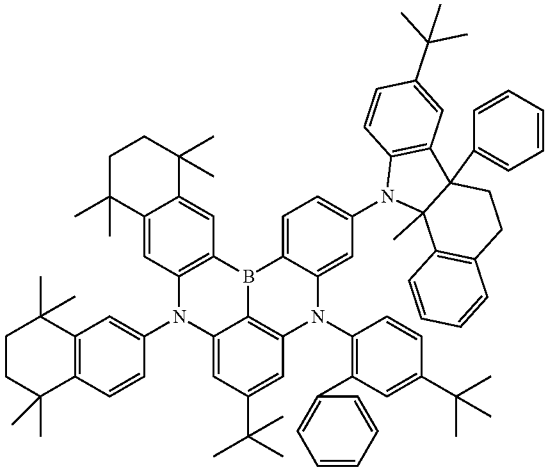 [SMILES: CC(C)(C)c1ccc(N2c3cc(N4c5ccc(C(C)(C)C)cc5C5(c6ccccc6)CCc6ccccc6C45C)ccc3B3c4cc5c(cc4N(c4ccc6c(c4)C(C)(C)CCC6(C)C)c4cc(C(C)(C)C)cc2c43)C(C)(C)CCC5(C)C)c(-c2ccccc2)c1]
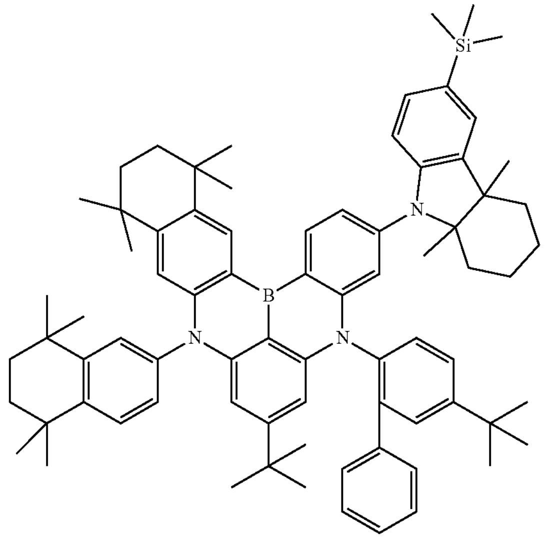

-continued
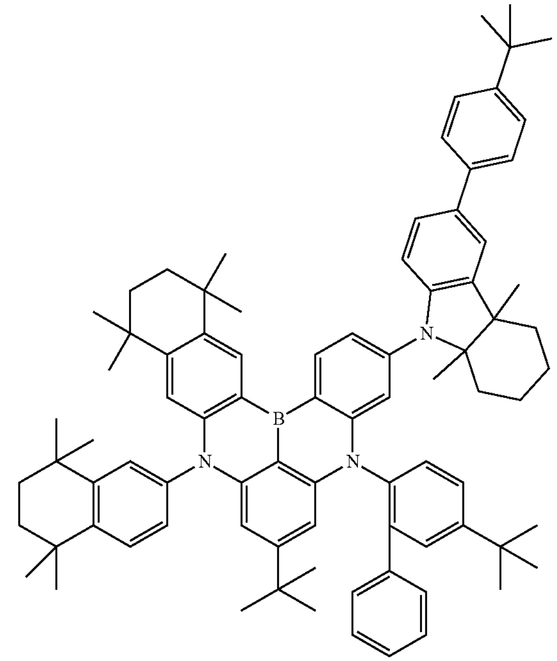
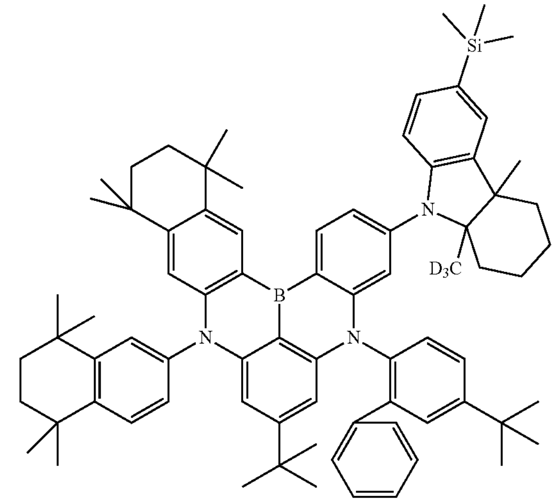
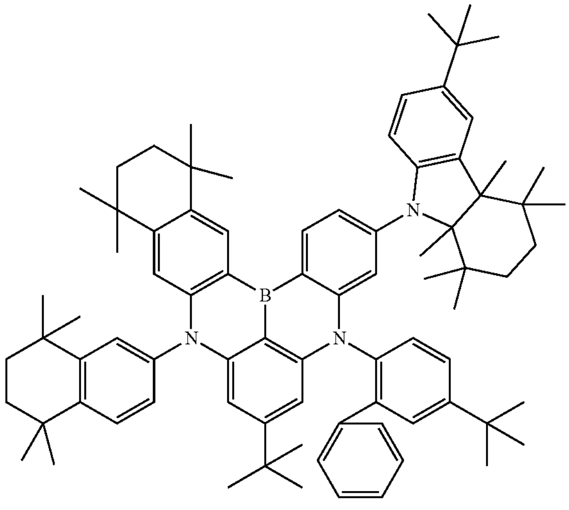
-continued
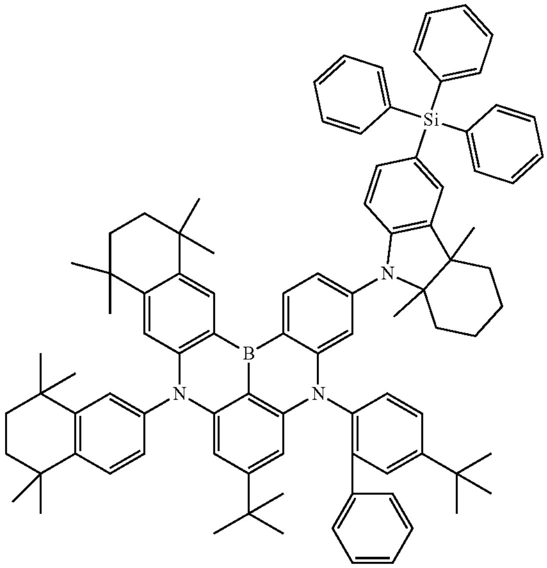
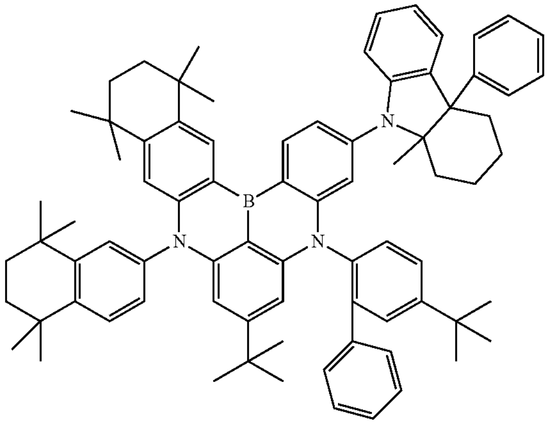
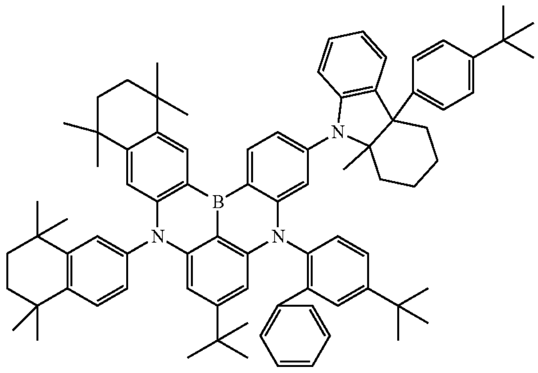

-continued
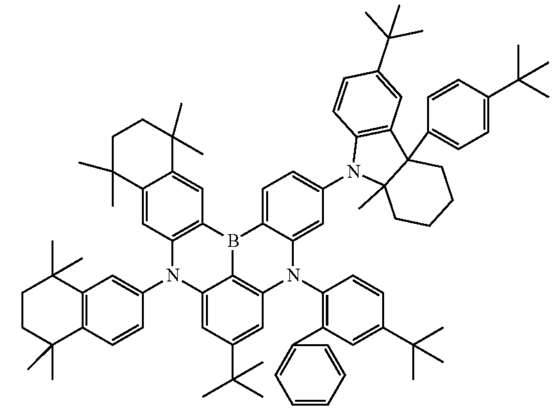
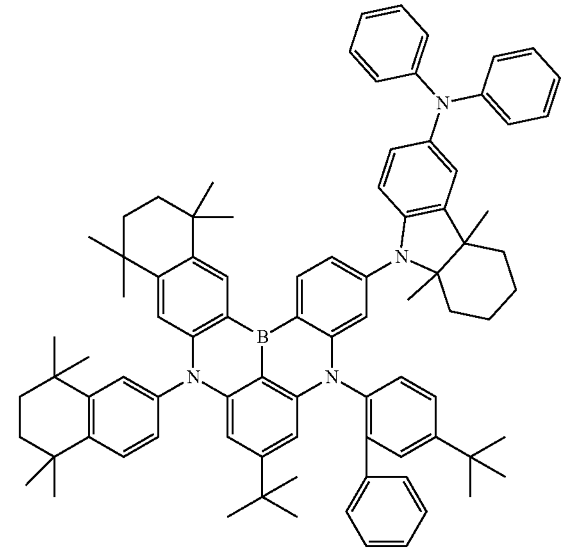
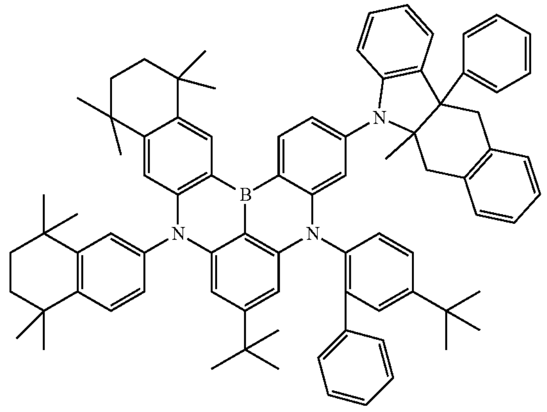
-continued
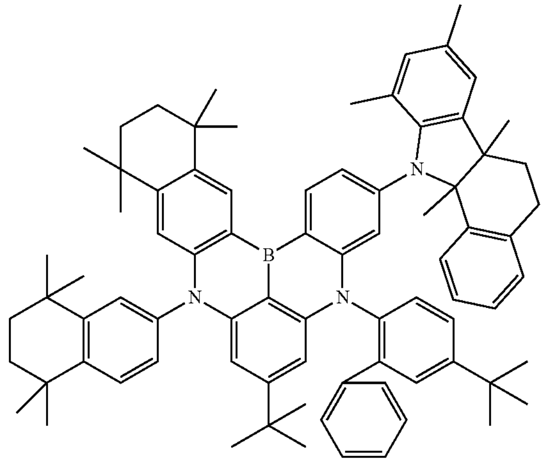
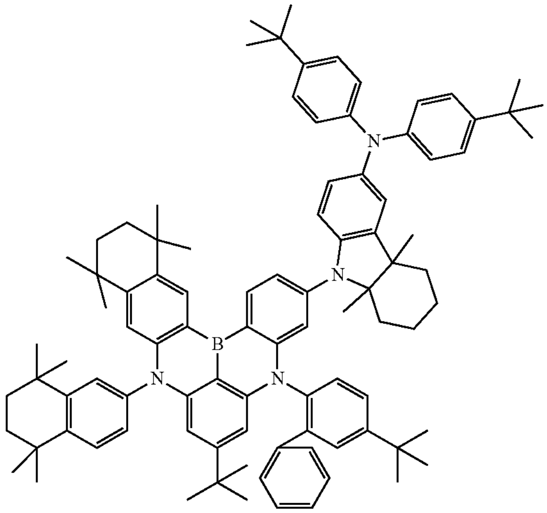
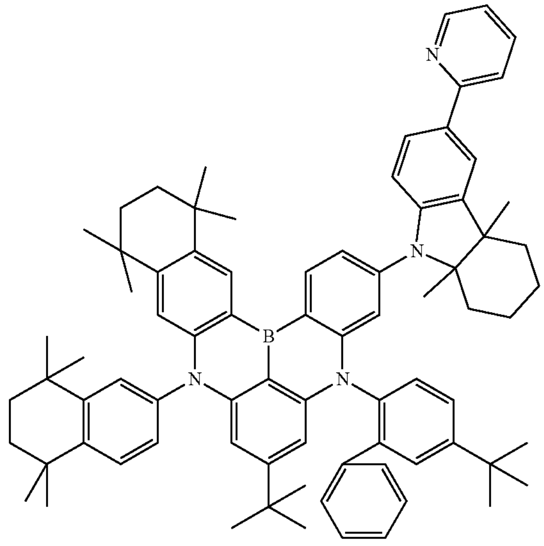

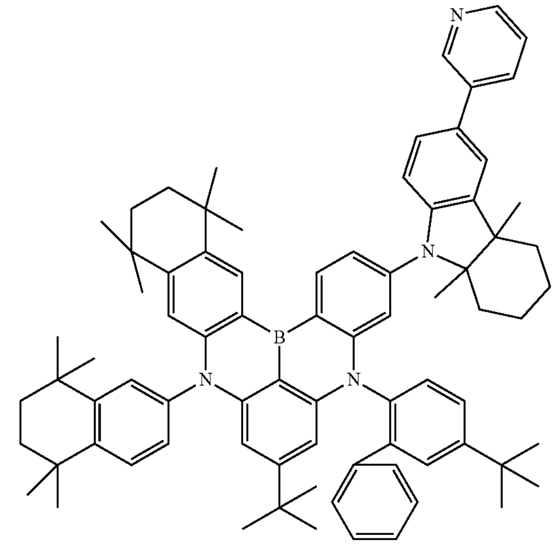
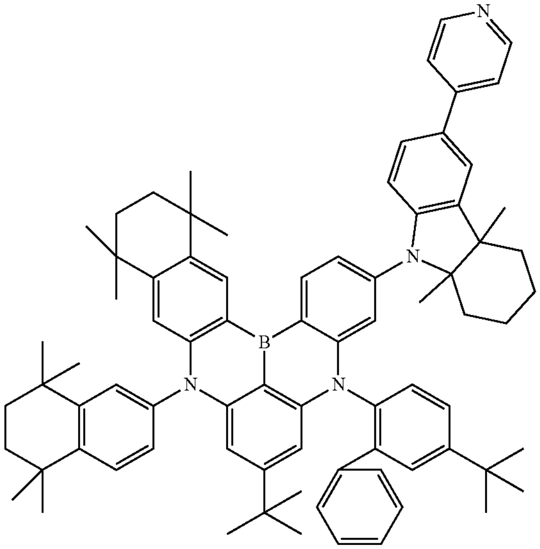
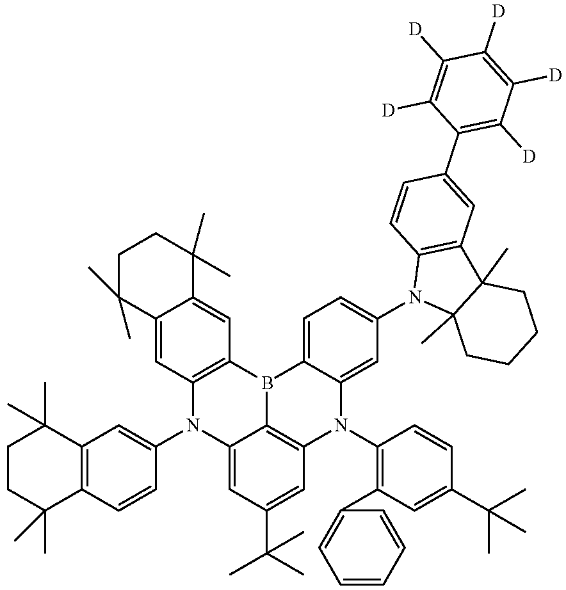
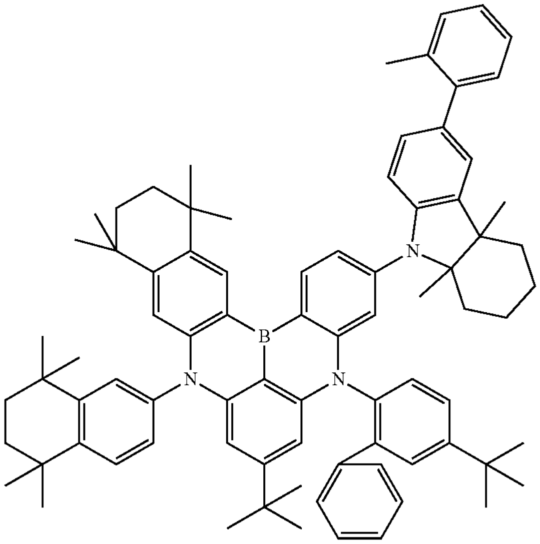
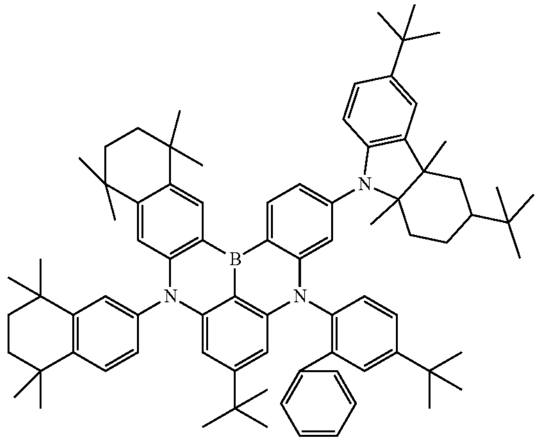
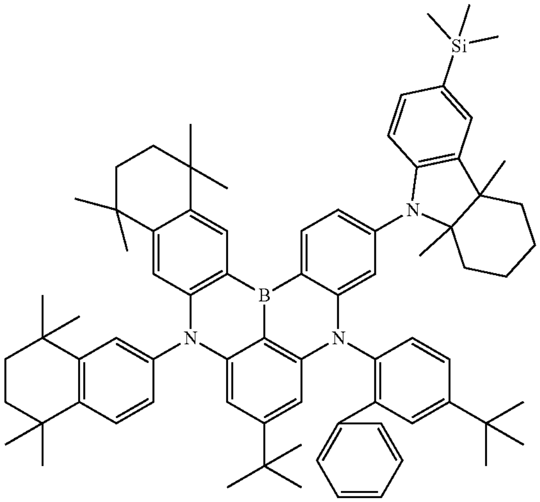

-continued
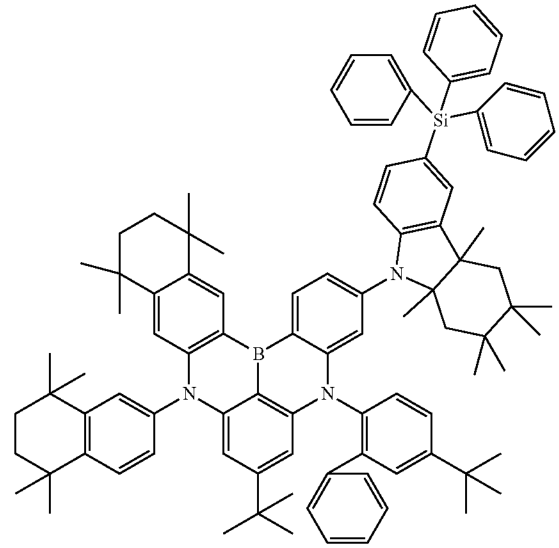
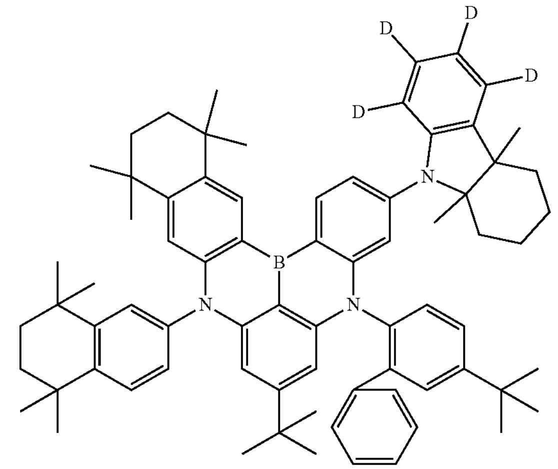
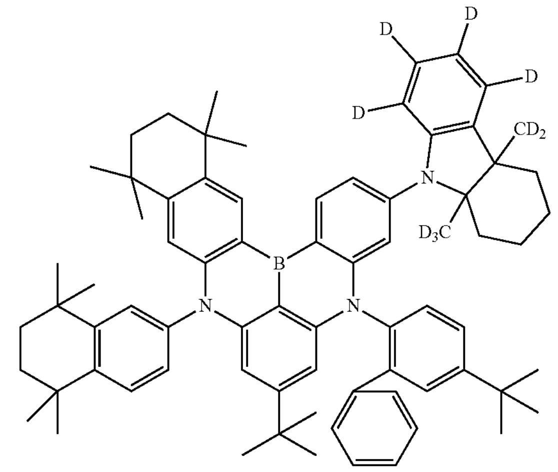
-continued
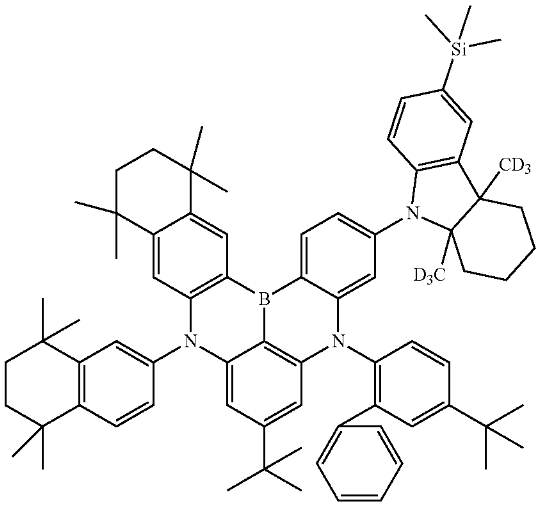
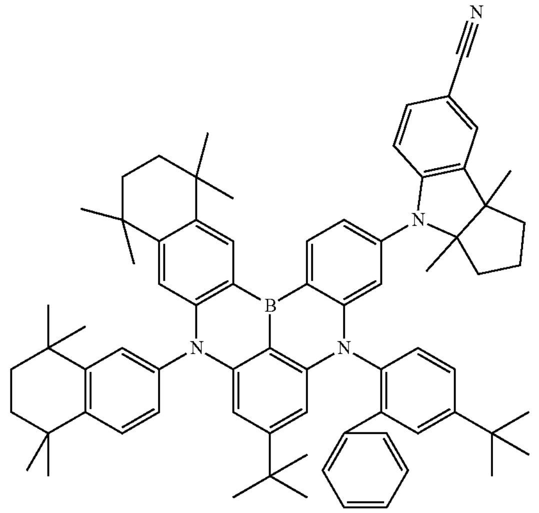
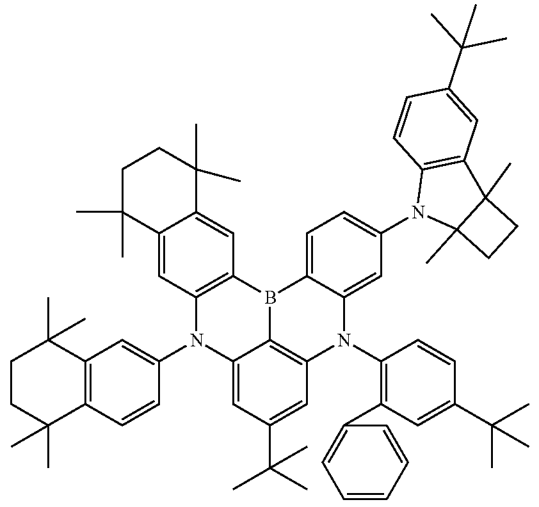

-continued
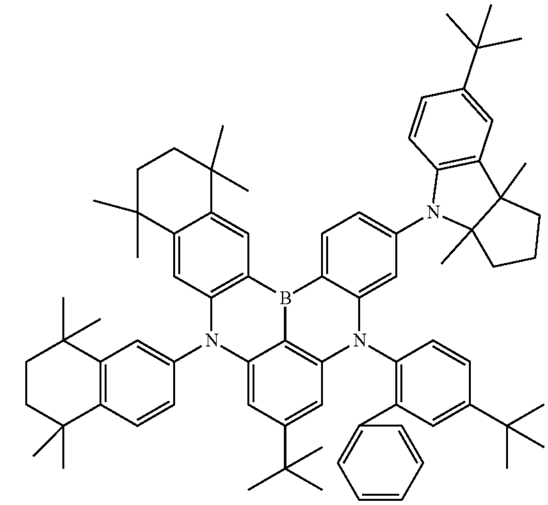
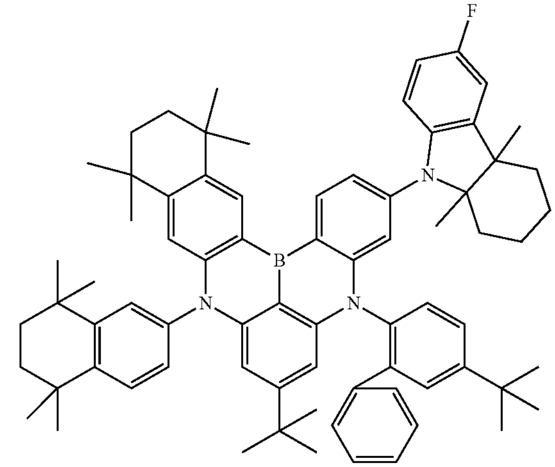
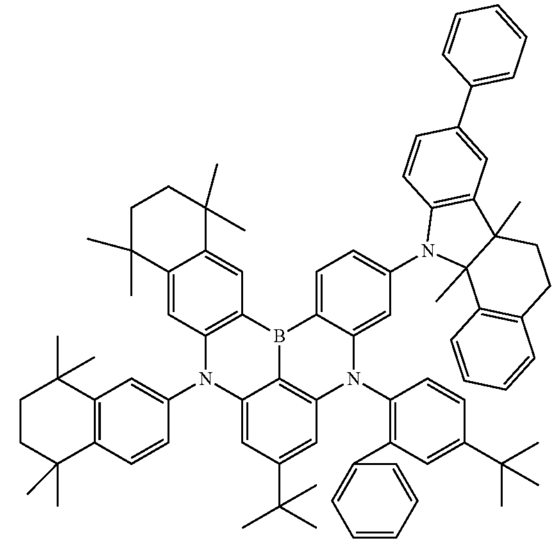
-continued
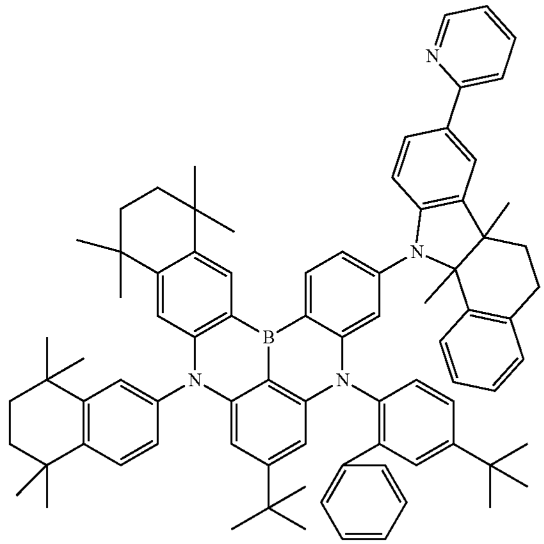
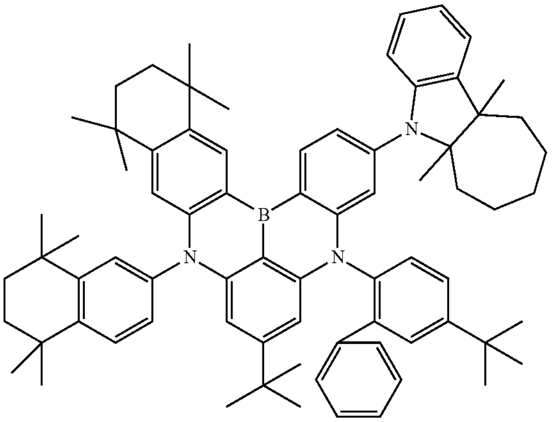
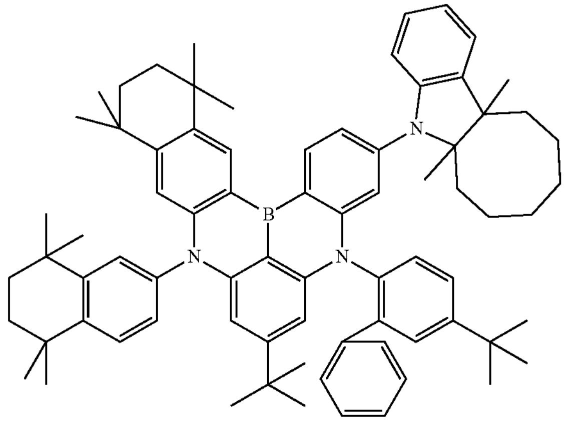

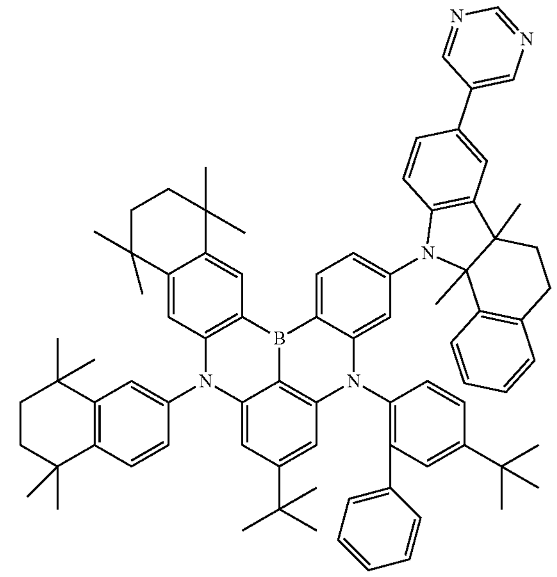
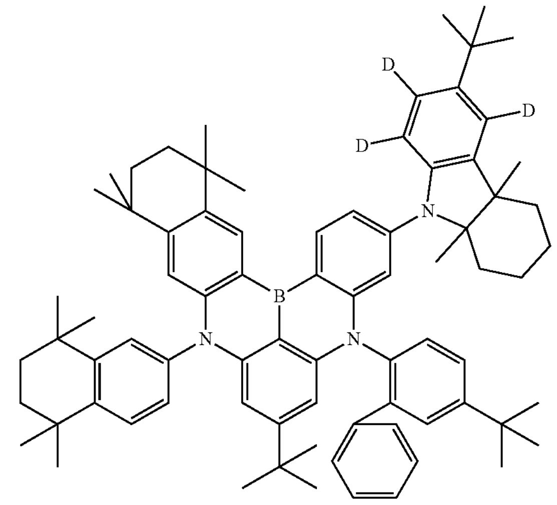
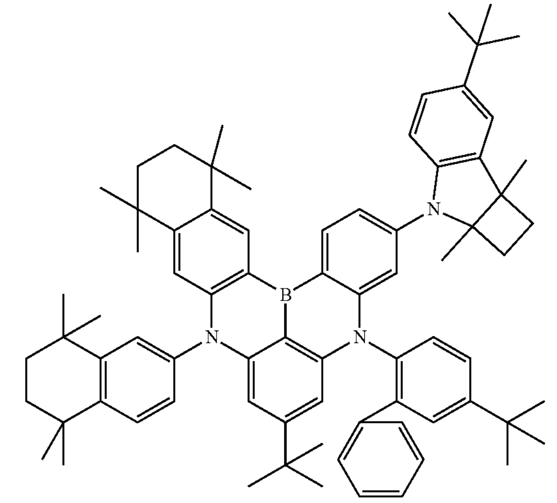
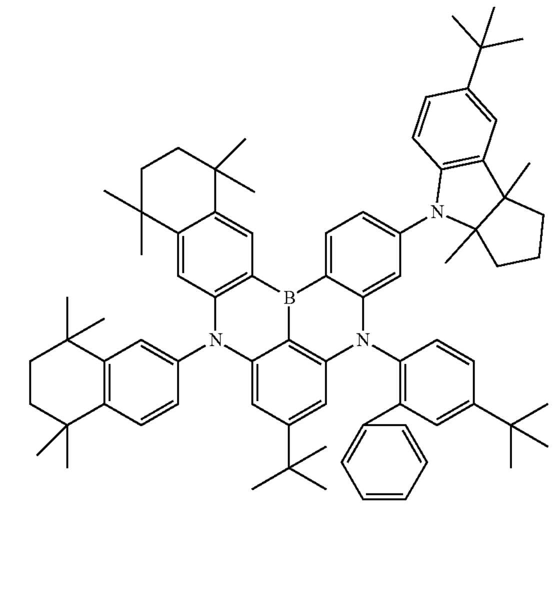
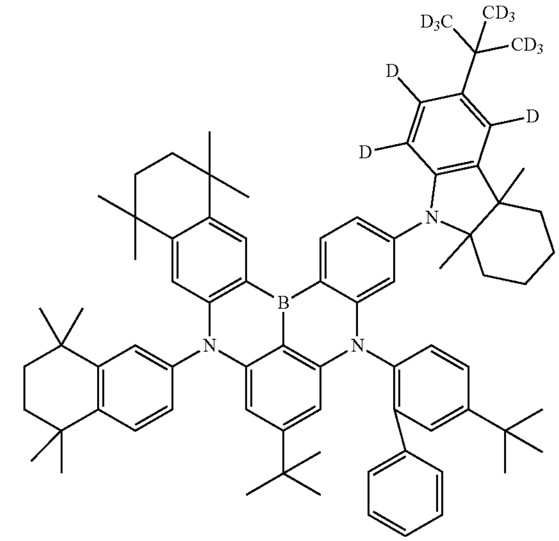
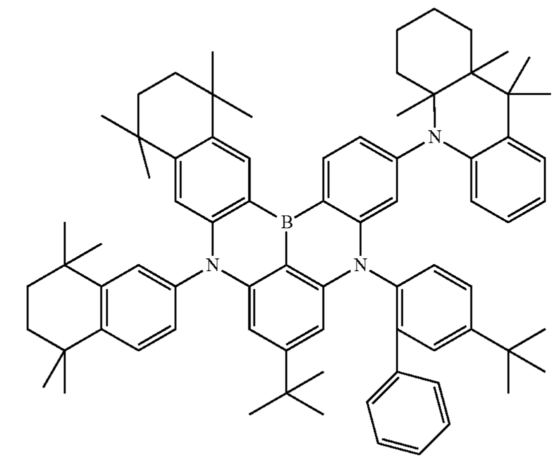

-continued
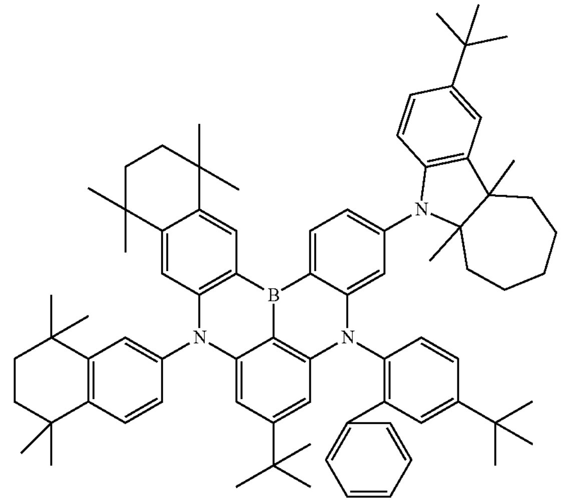
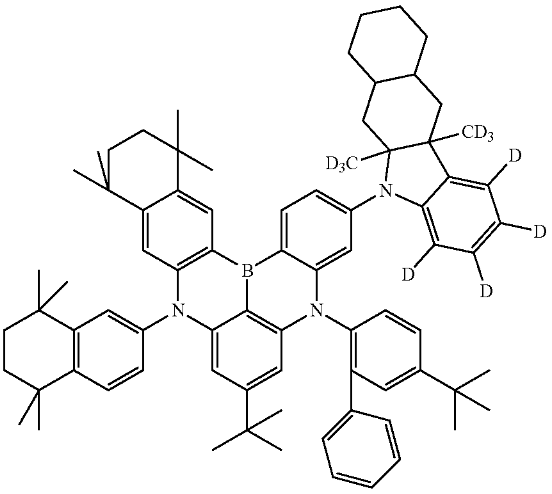
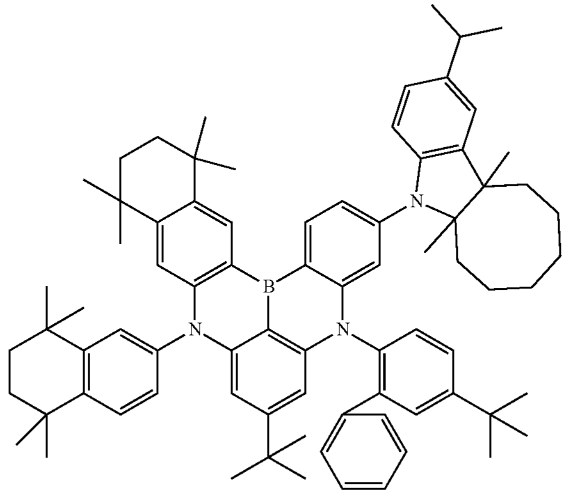
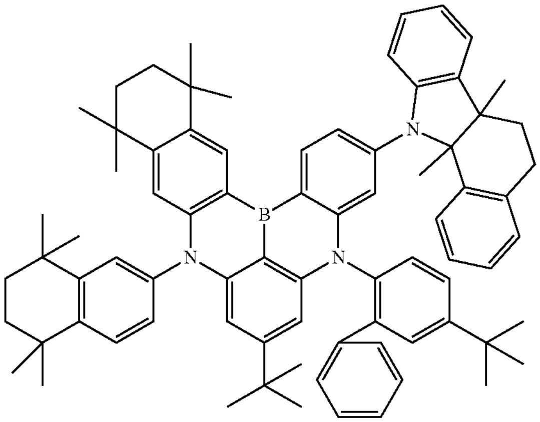
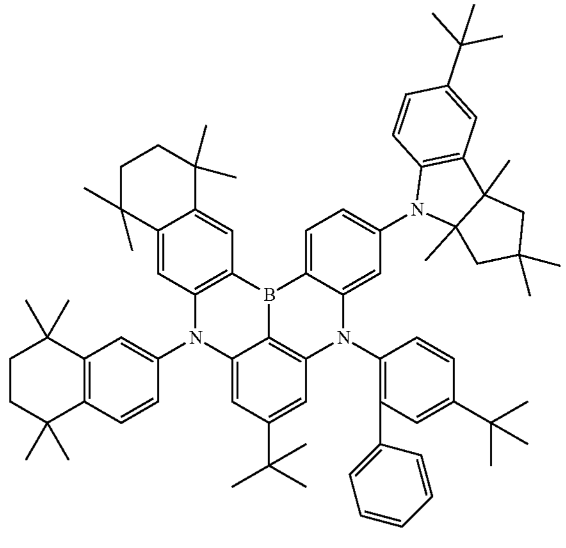
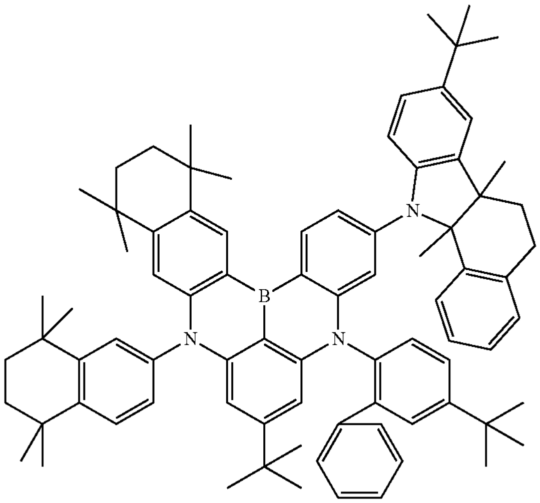
-continued -continued
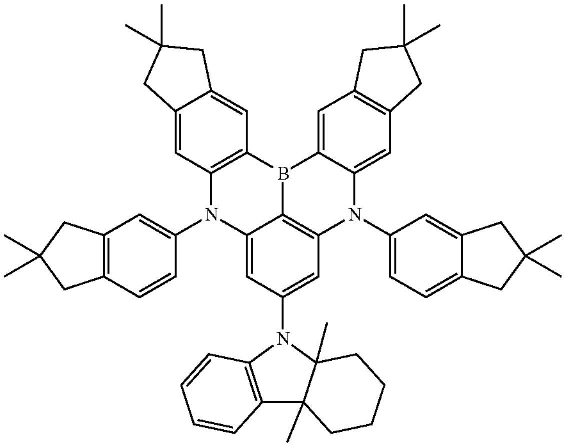
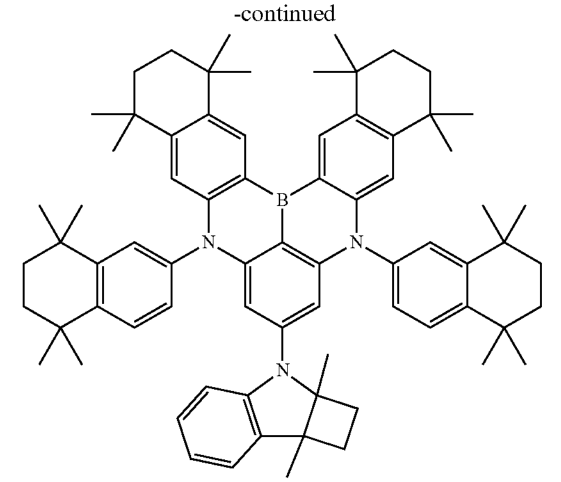
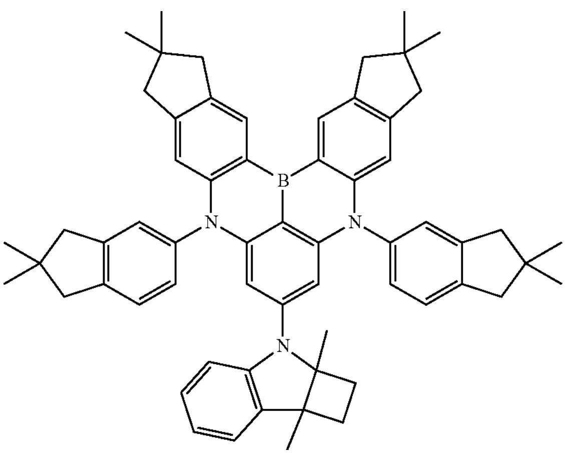
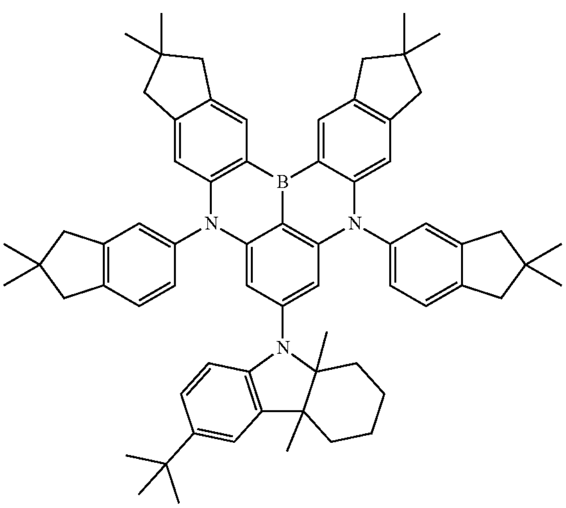
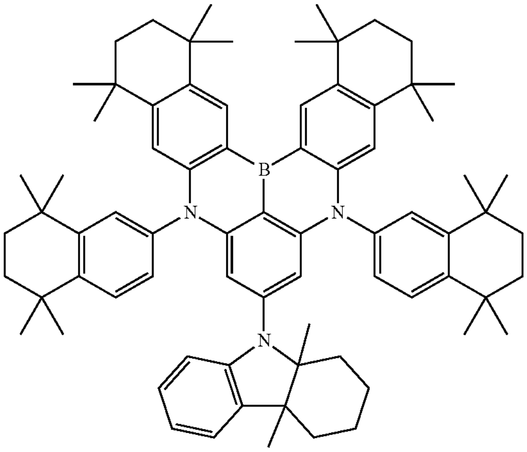
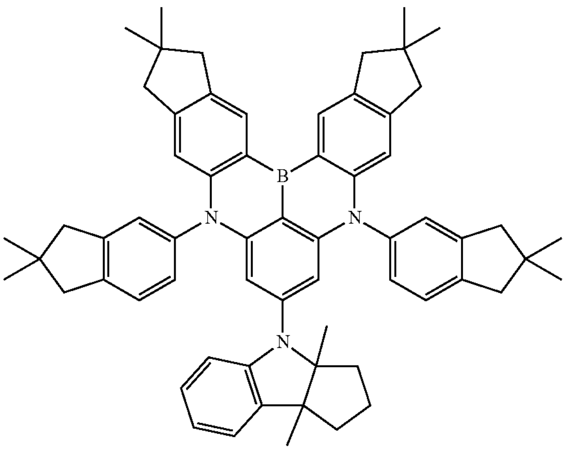

-continued
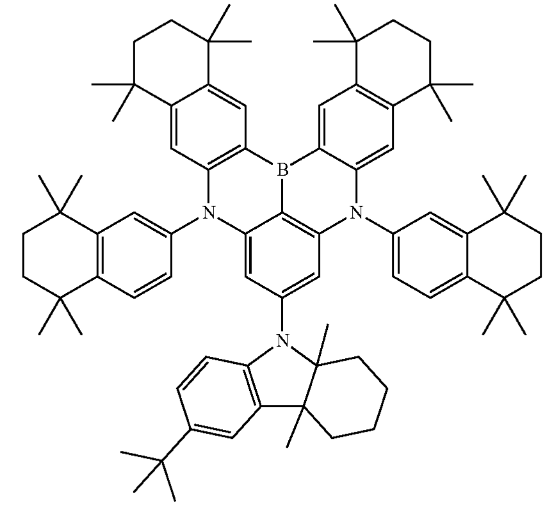
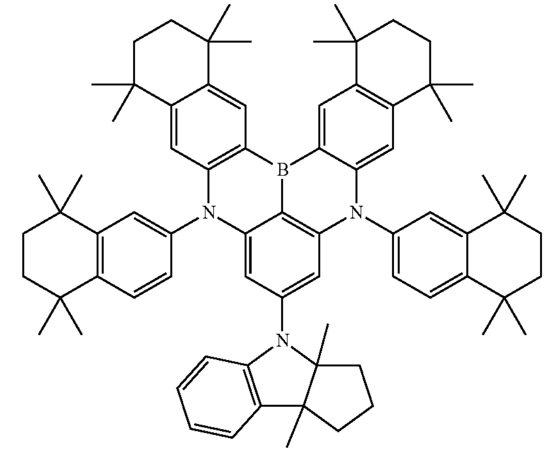
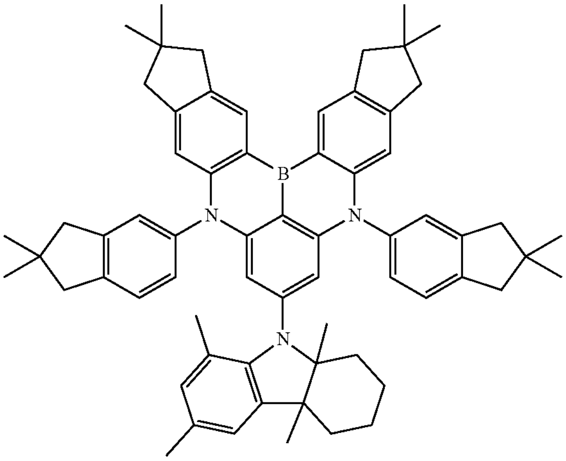
-continued
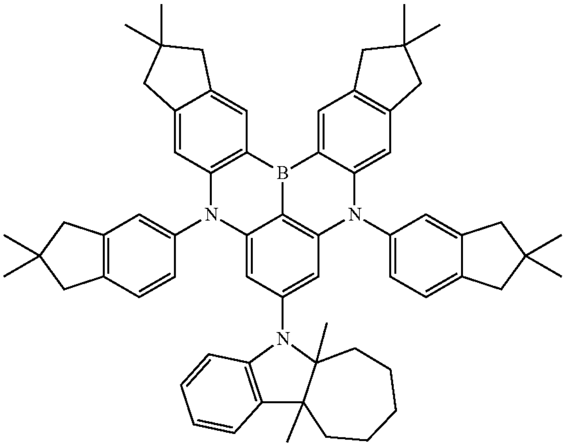
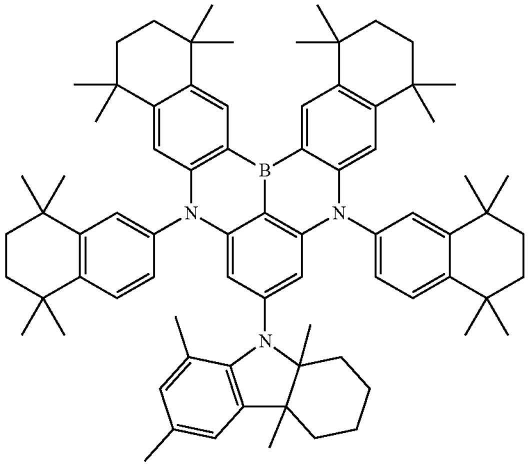
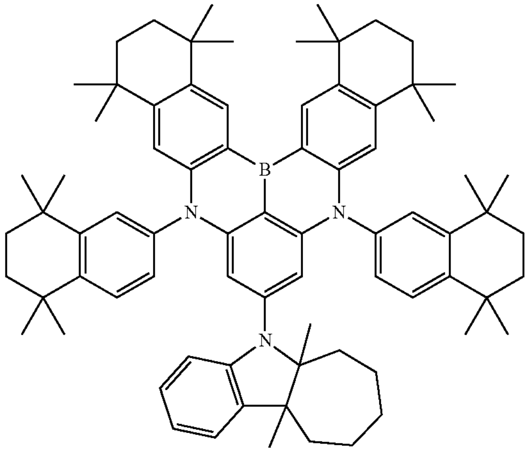

-continued
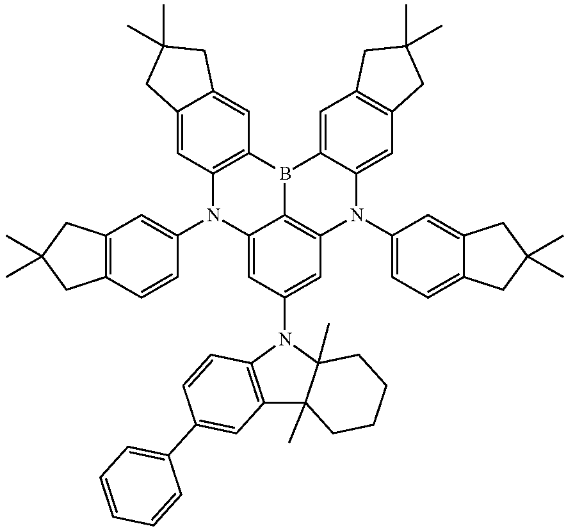
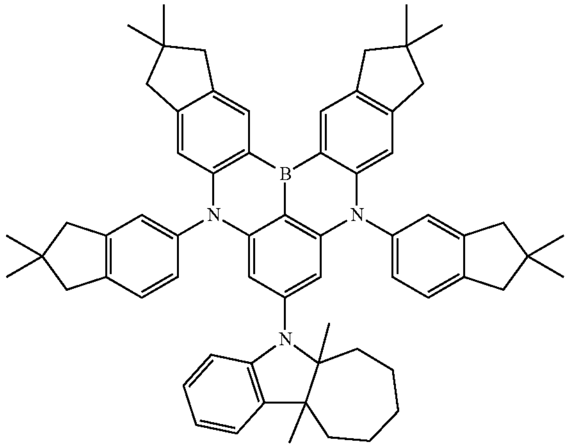
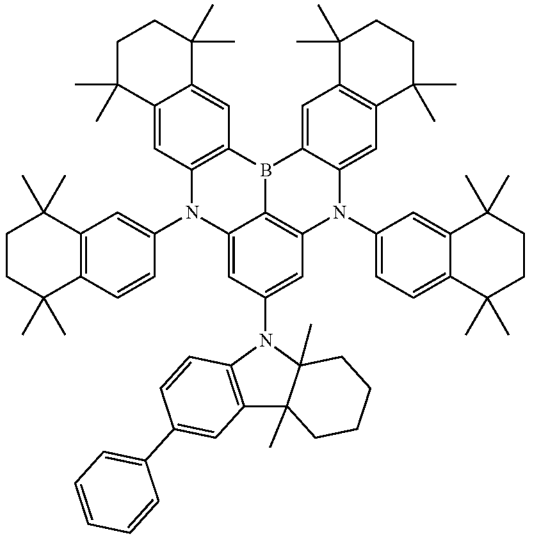
-continued
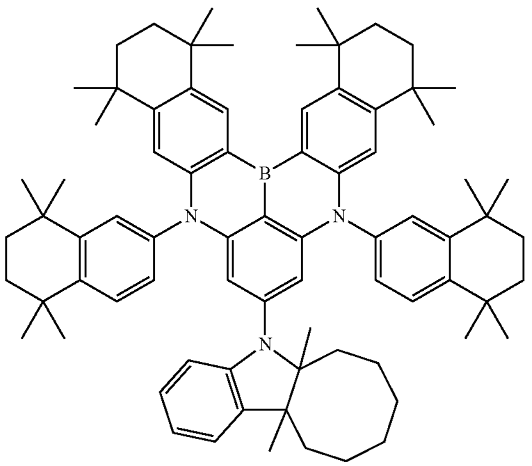
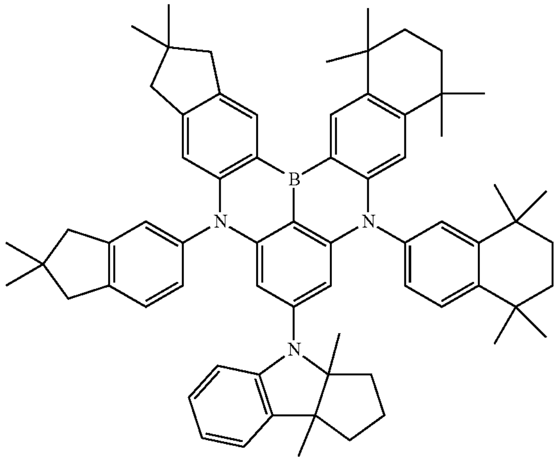
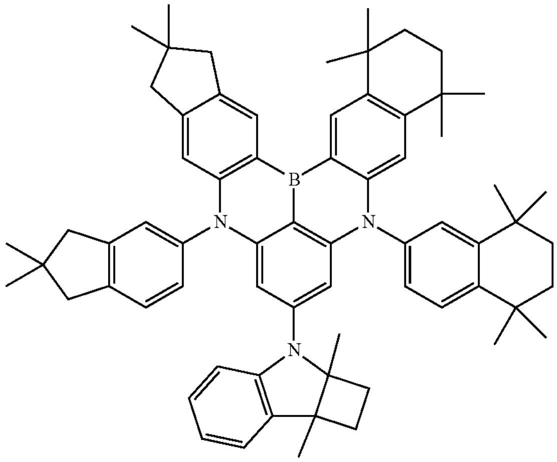

-continued
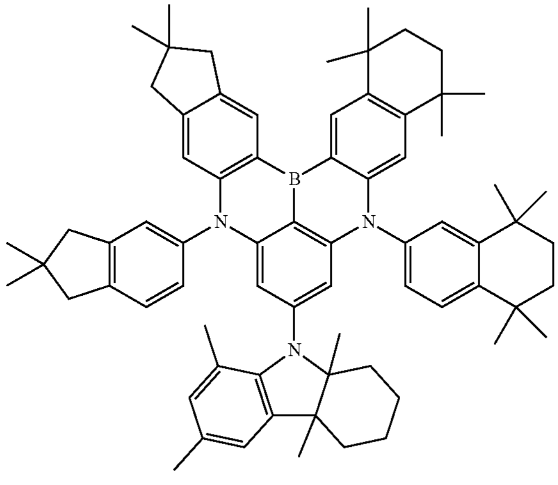
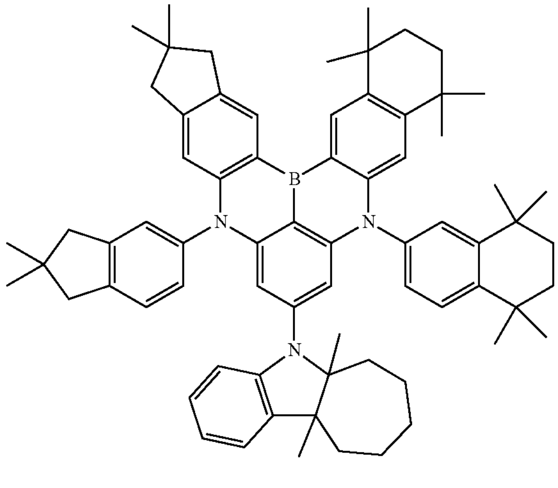
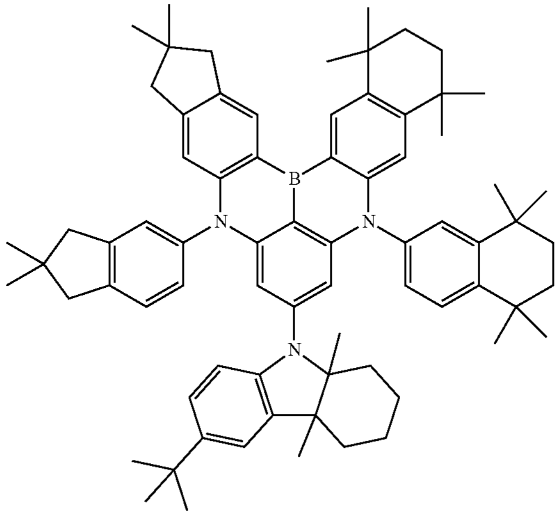
-continued
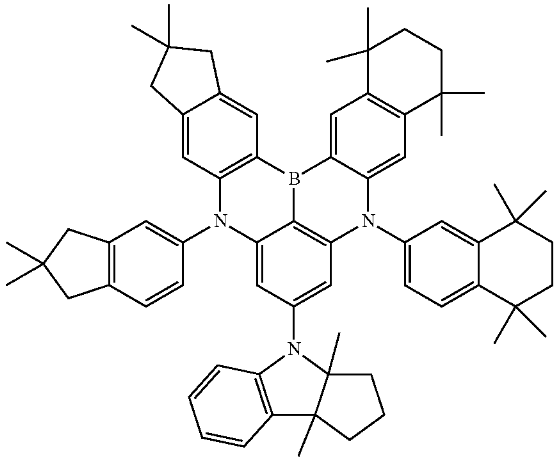
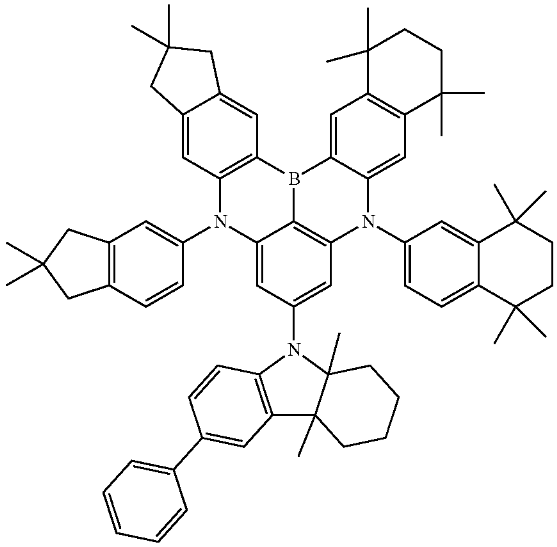
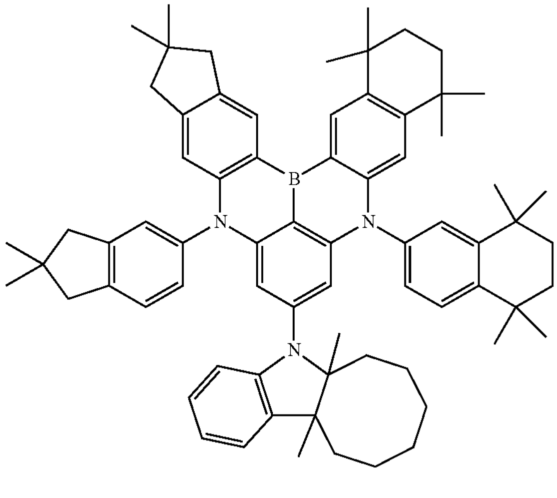

-continued
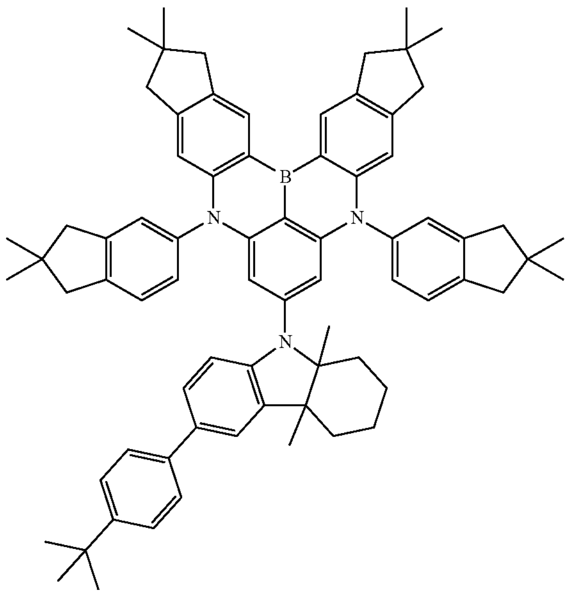
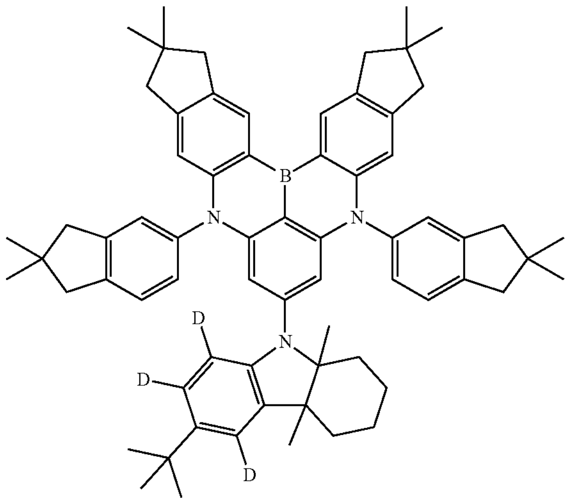
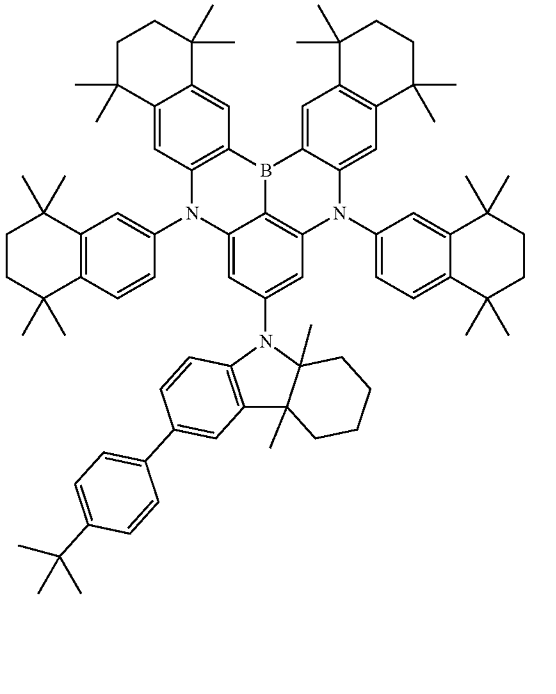
-continued
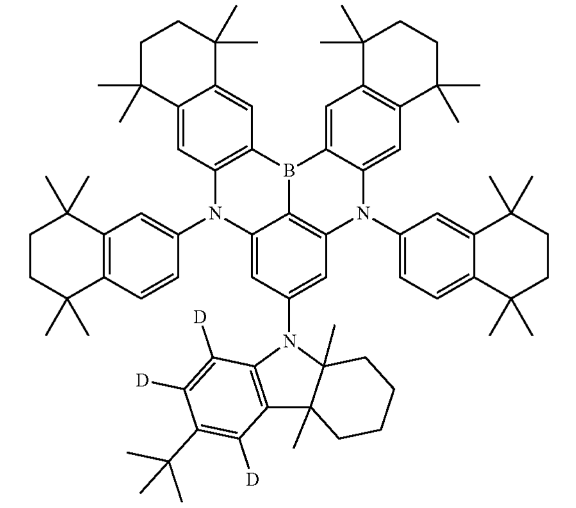
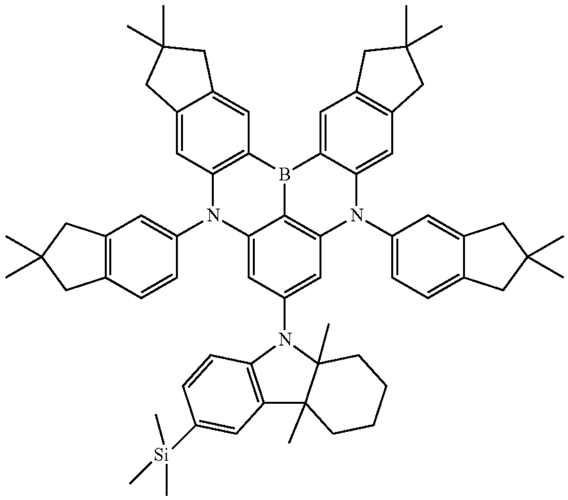
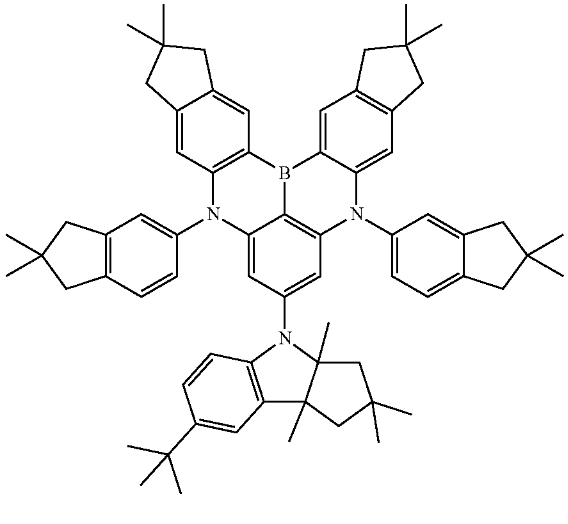

-continued
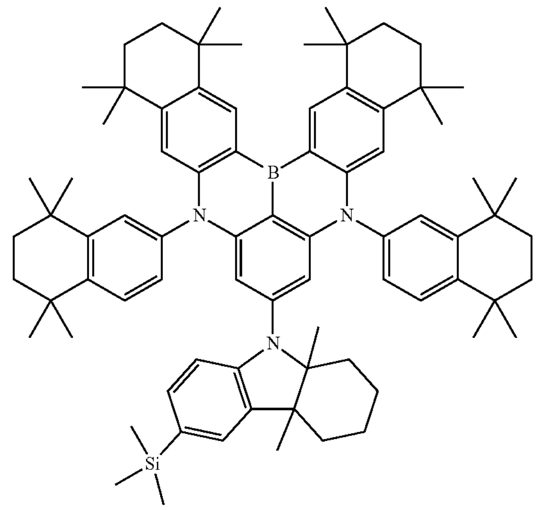
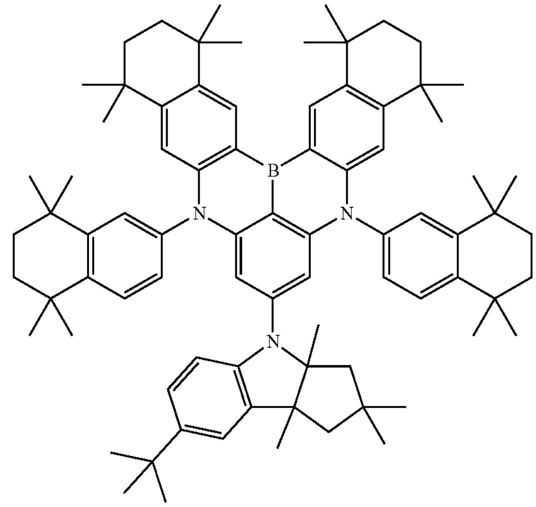
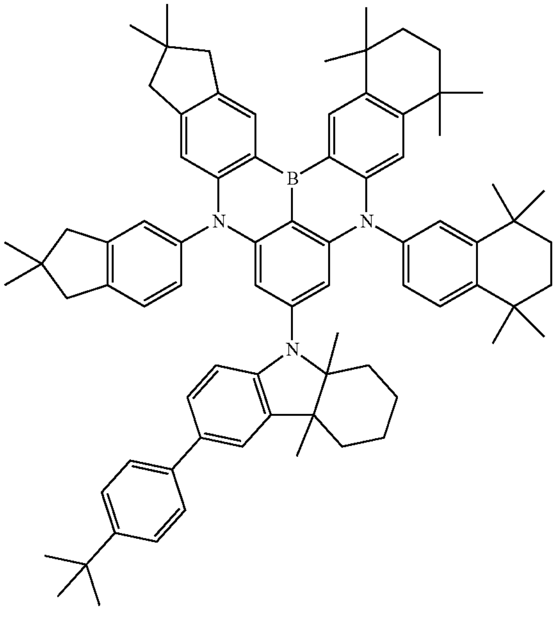
-continued
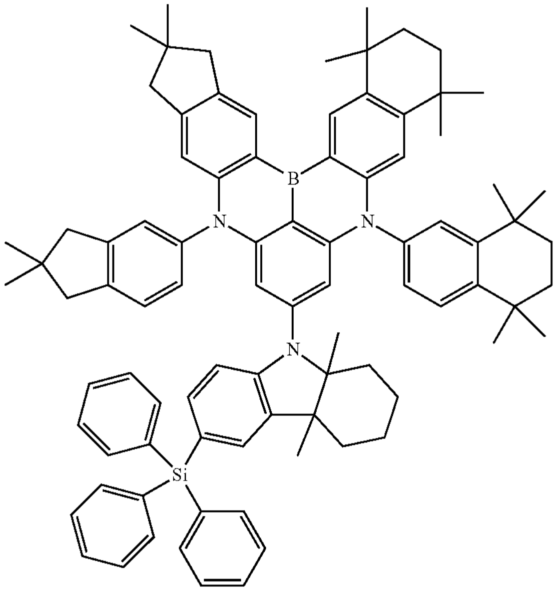
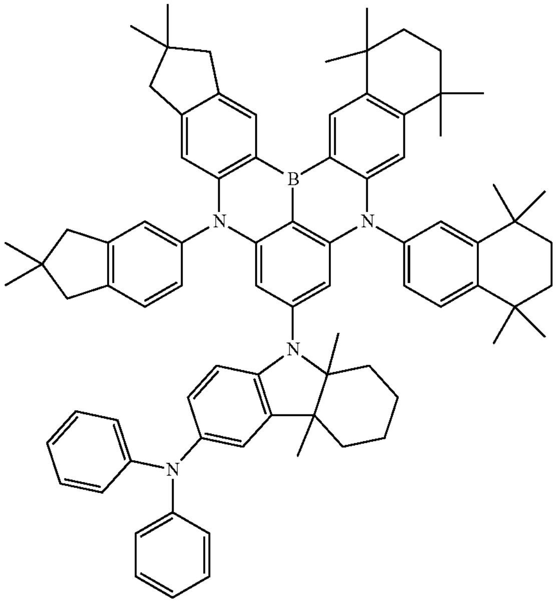
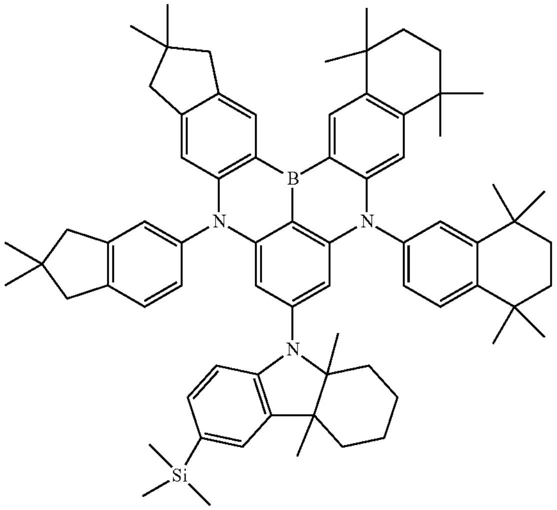

-continued
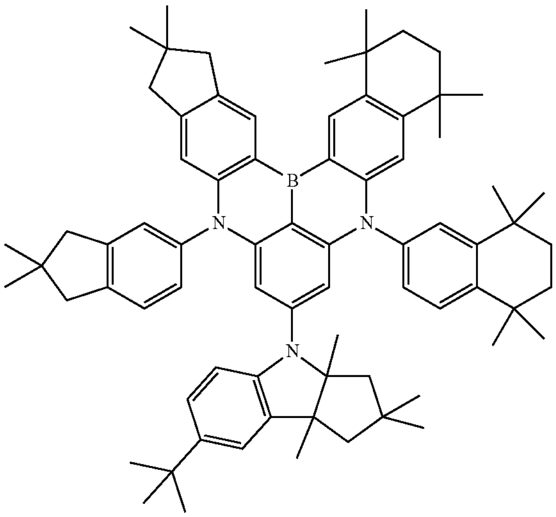
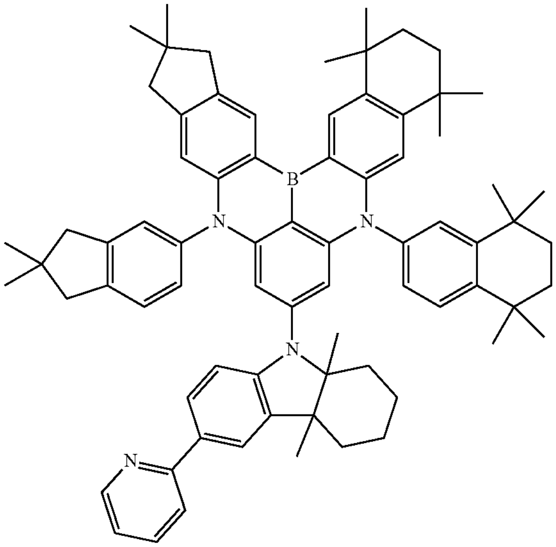
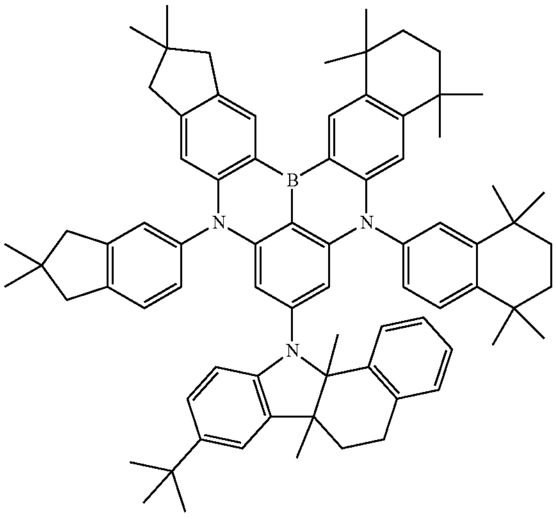
-continued
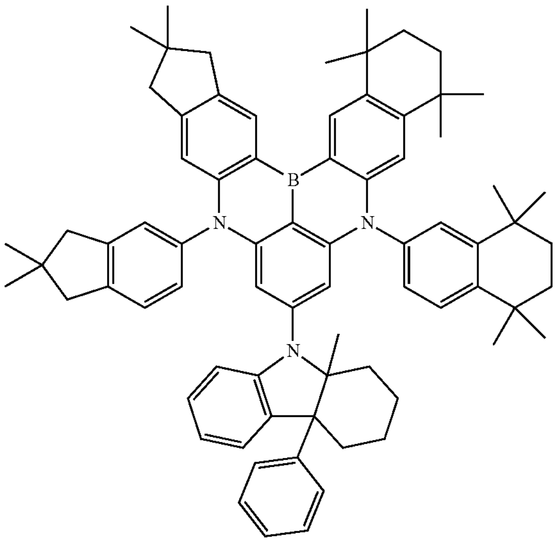
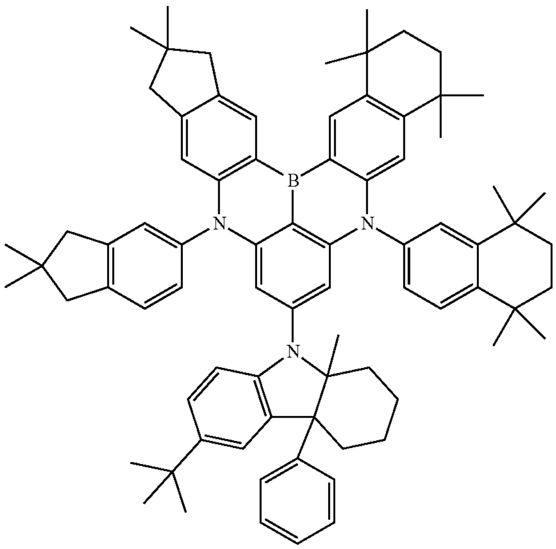
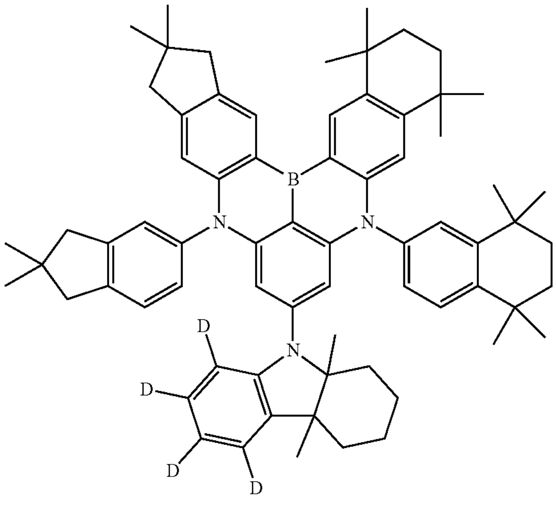

-continued
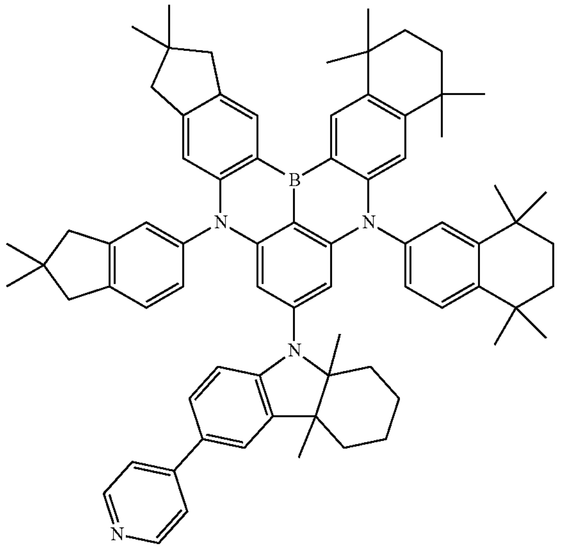
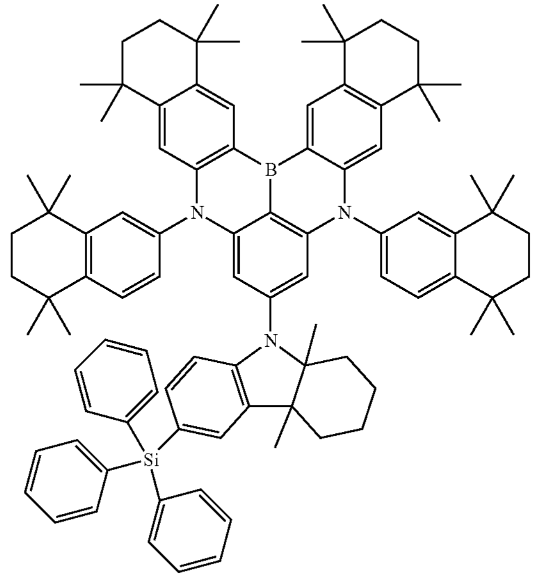
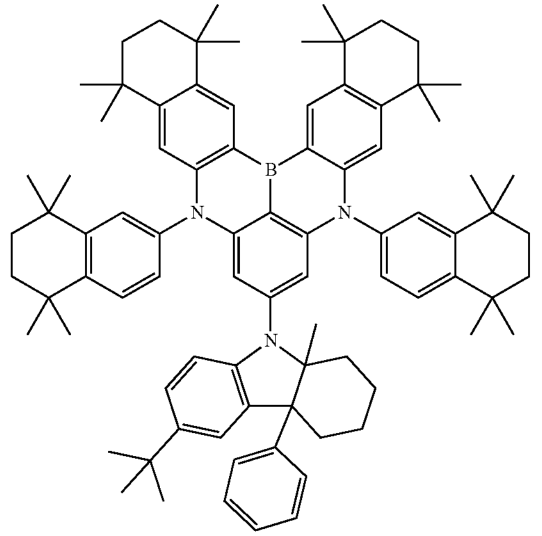
-continued
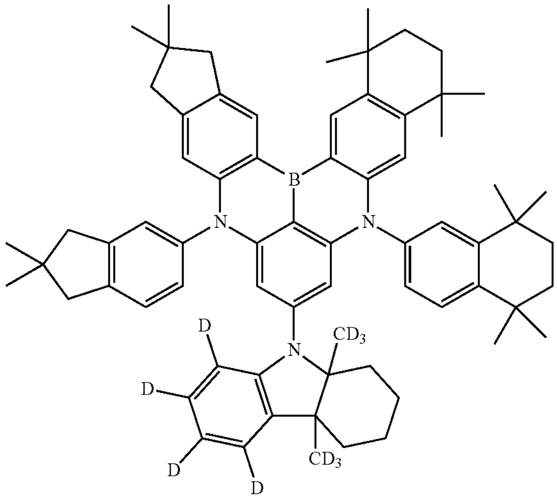
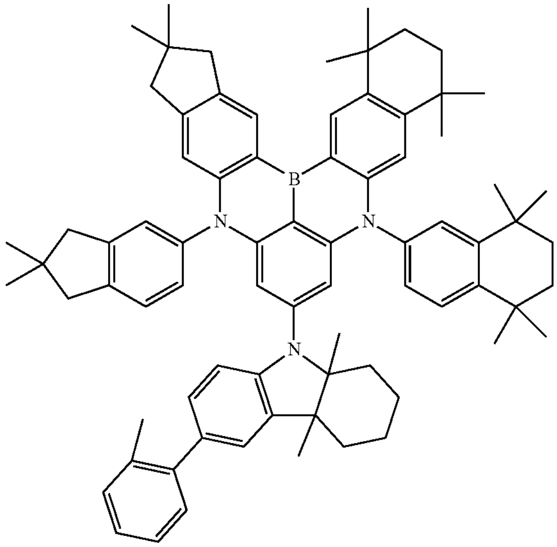
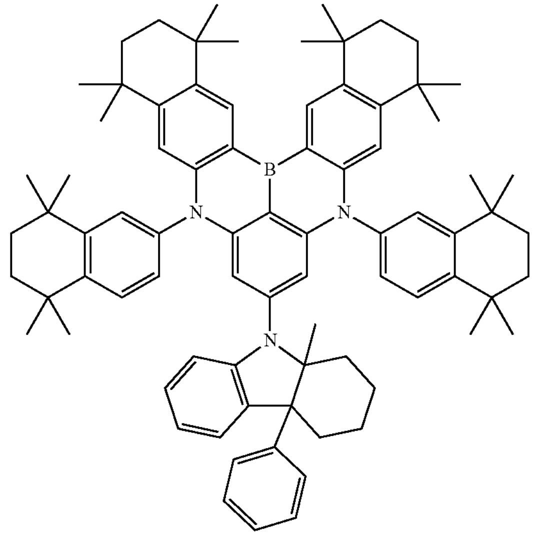

-continued
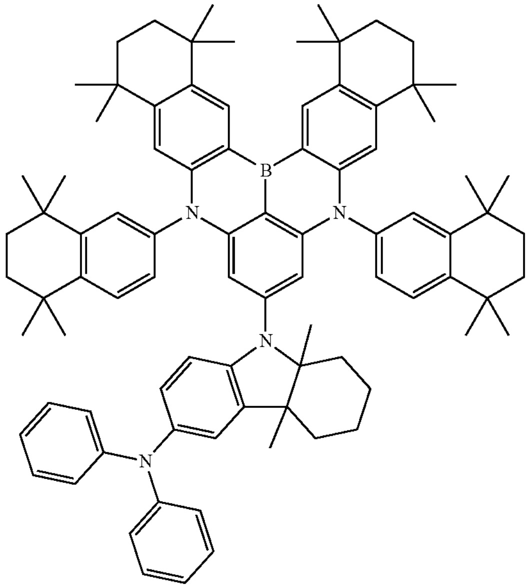
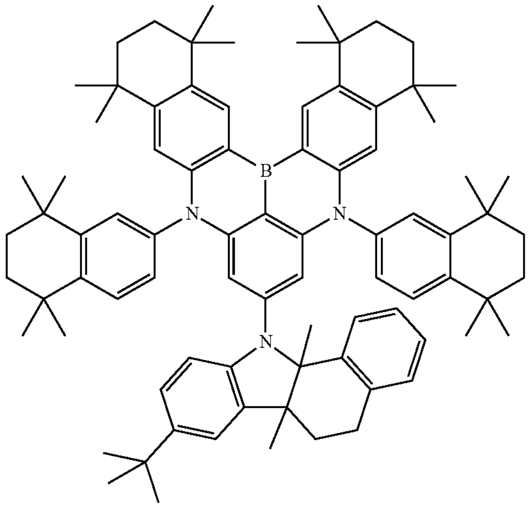
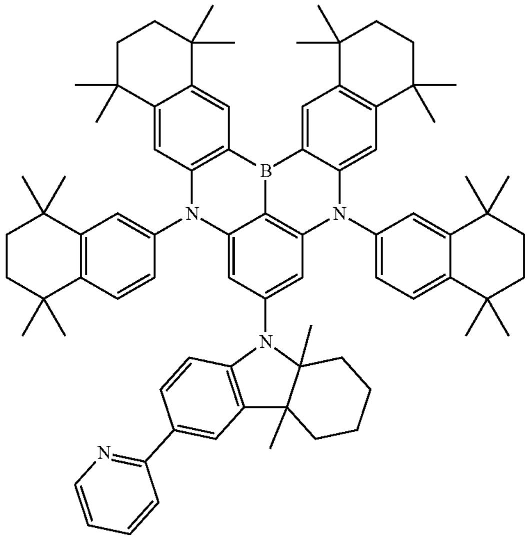
-continued
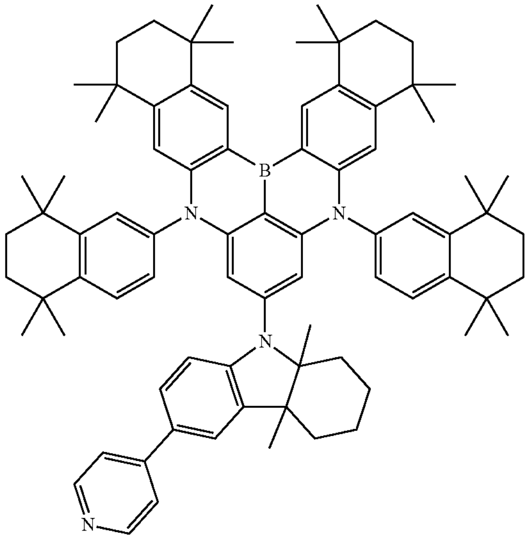
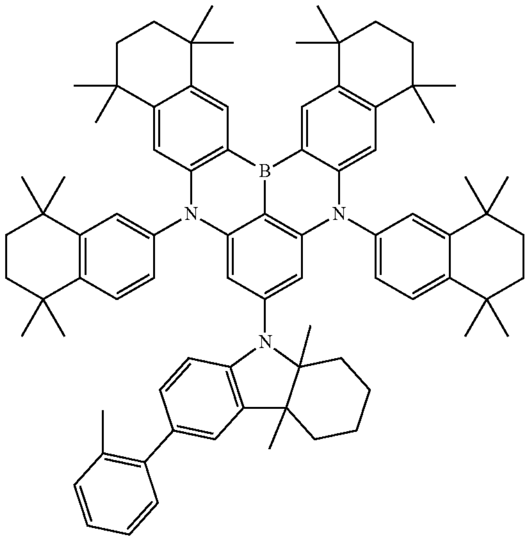
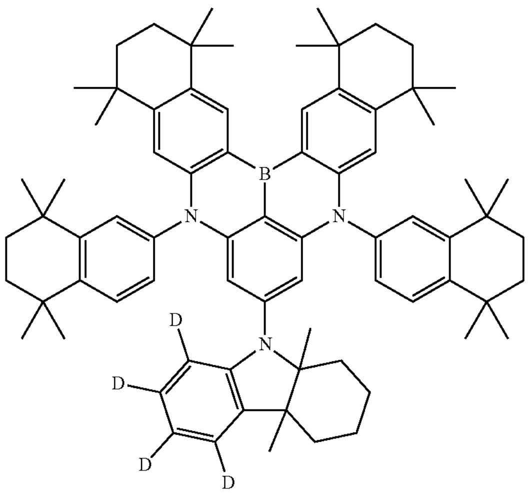

-continued
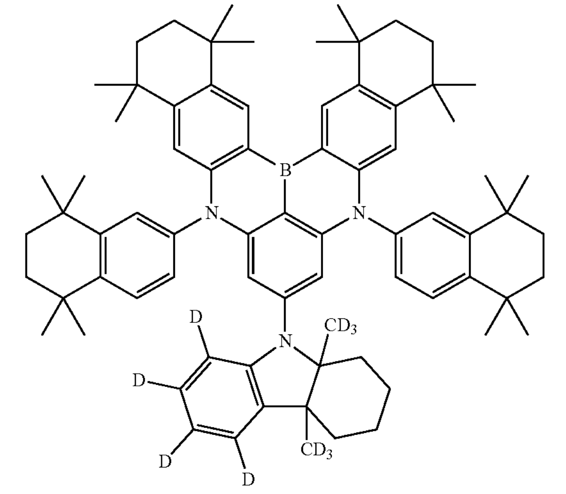
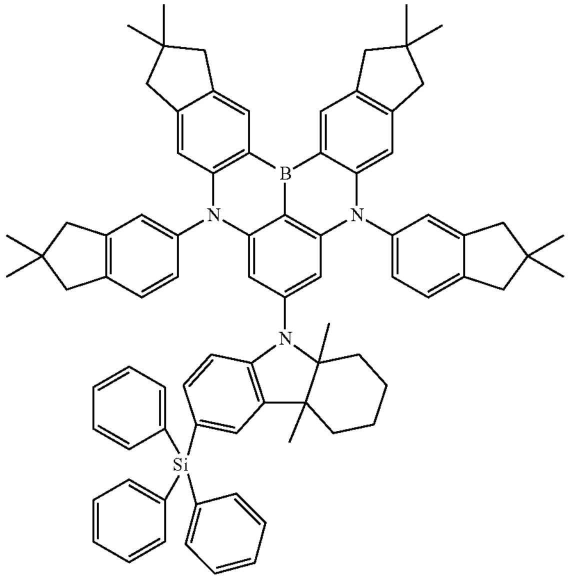
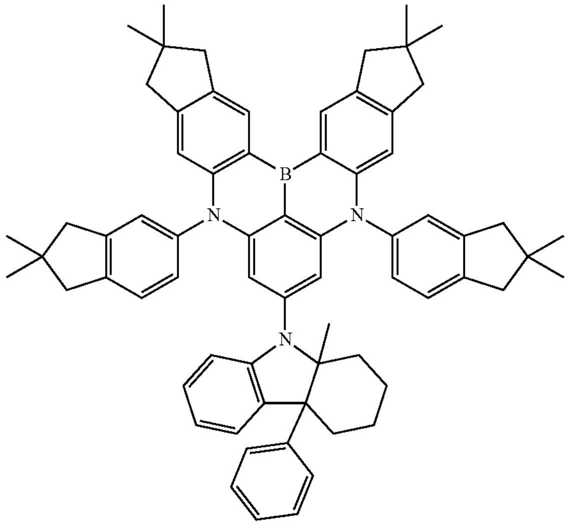
-continued
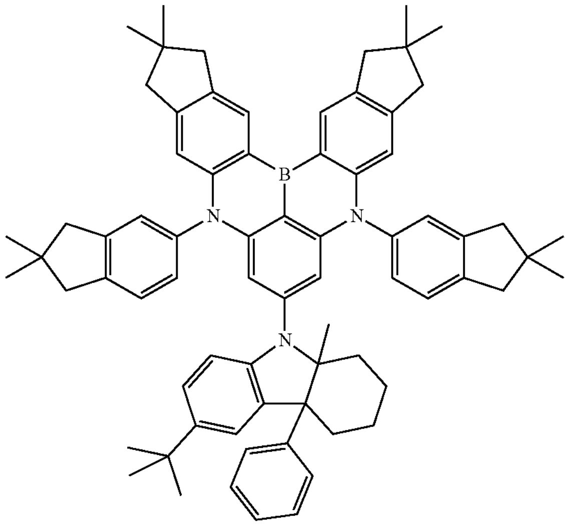
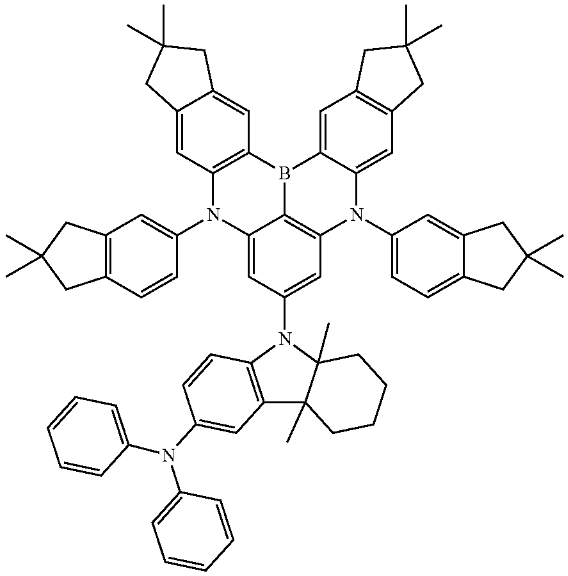
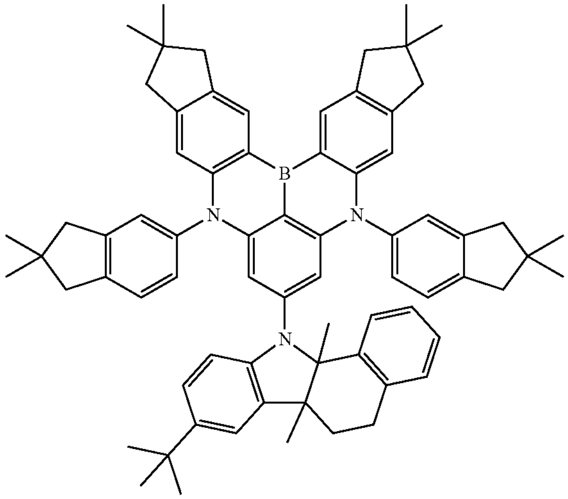

-continued
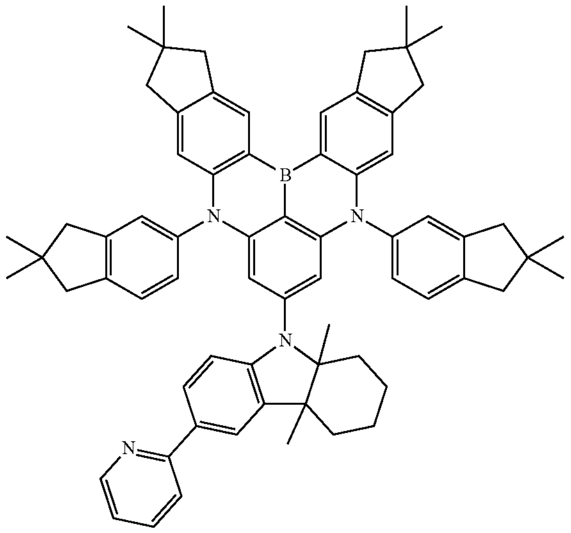
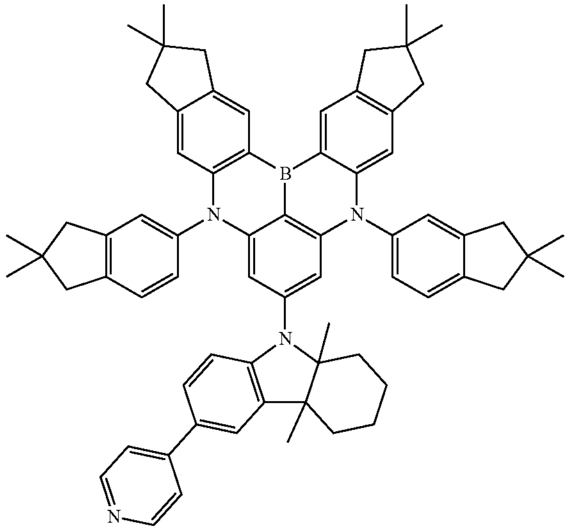
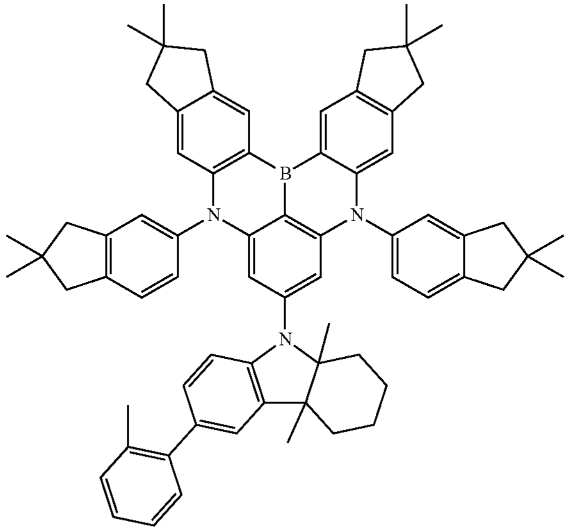
-continued
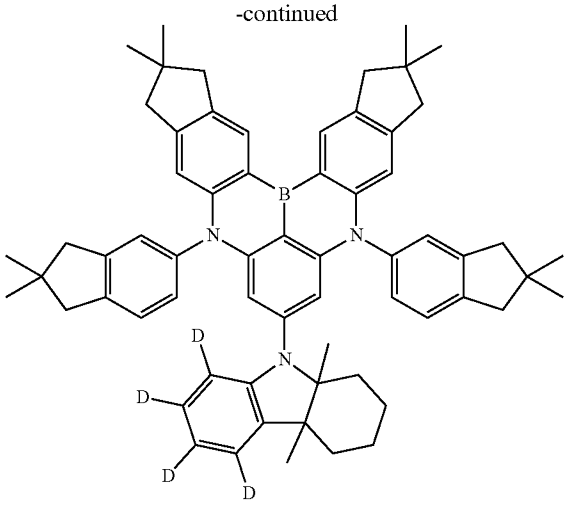
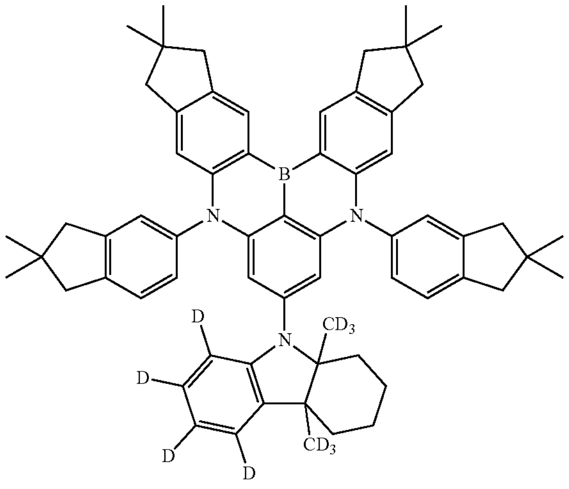
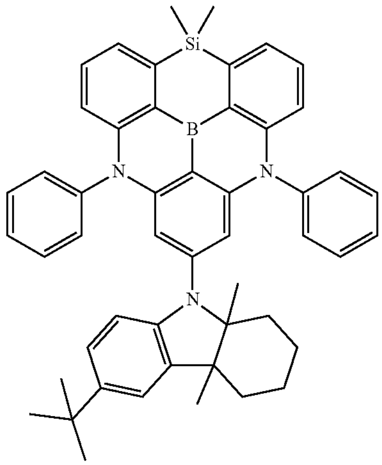

-continued
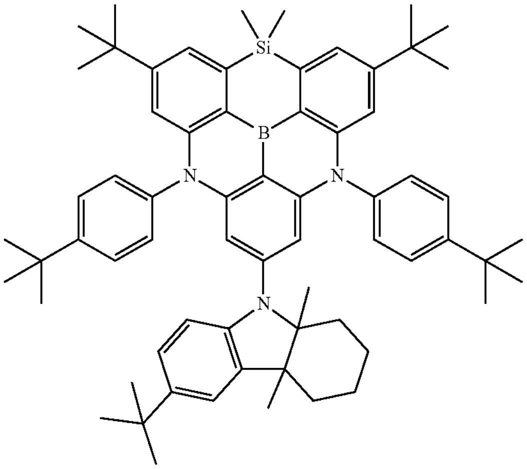
-continued
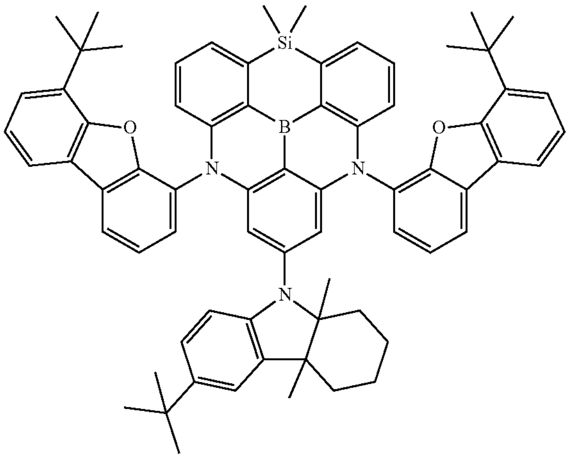
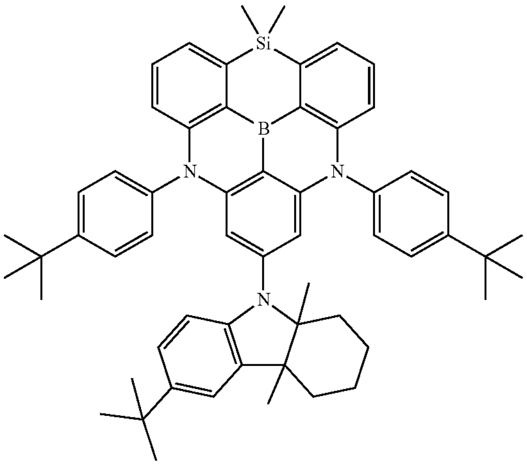
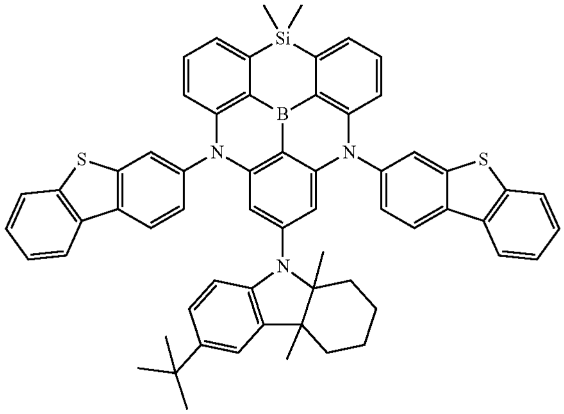
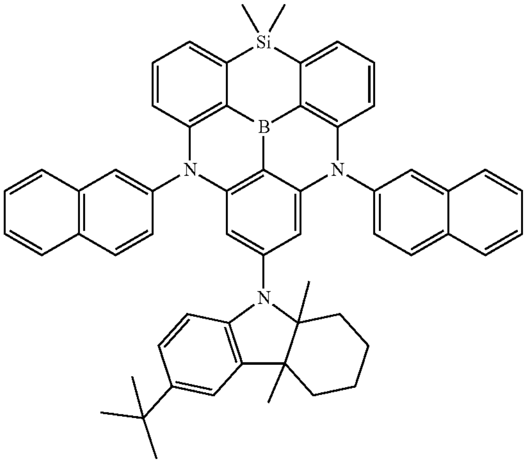
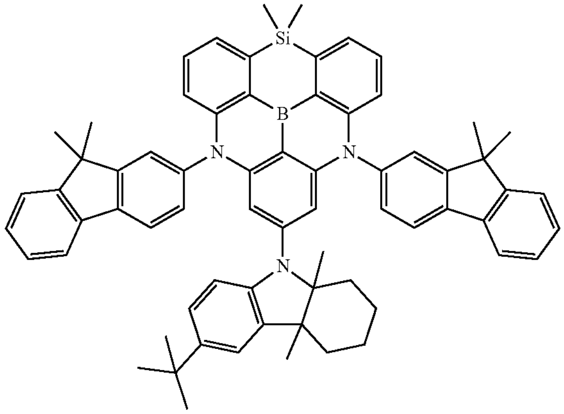

-continued
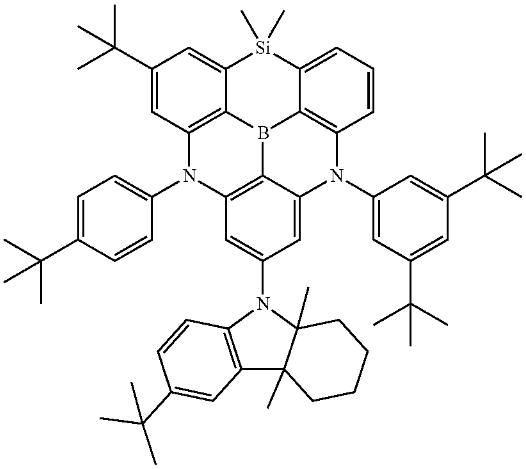
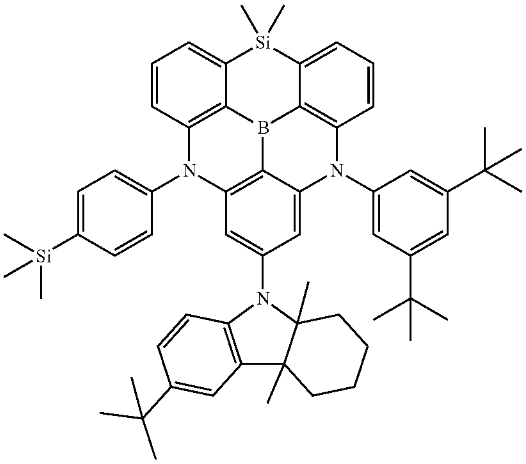
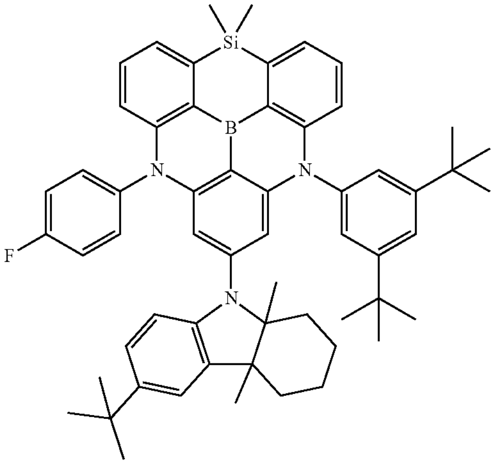
-continued
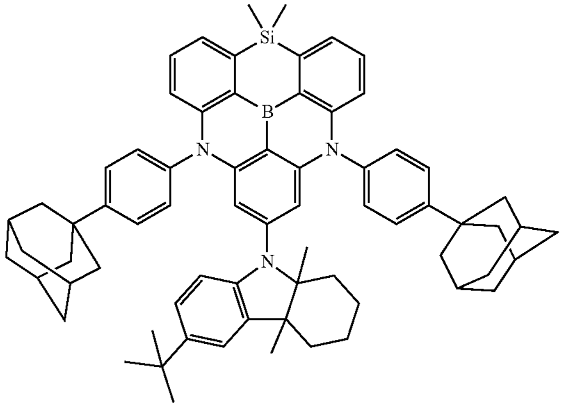
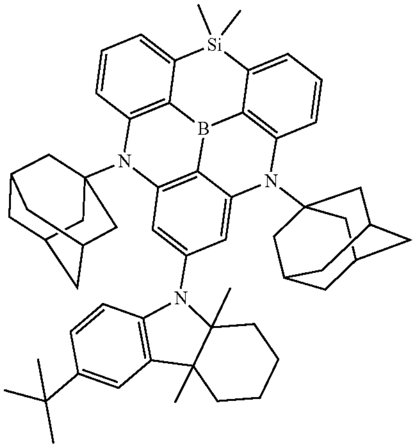
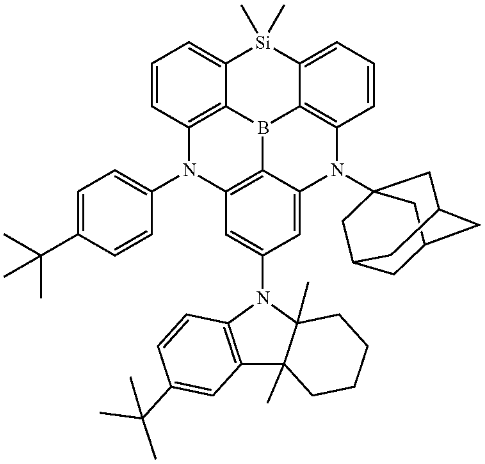

-continued
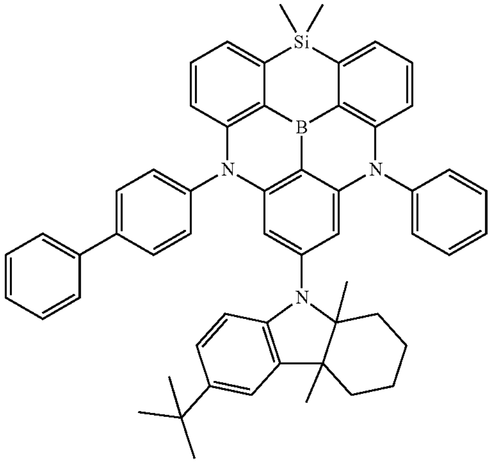
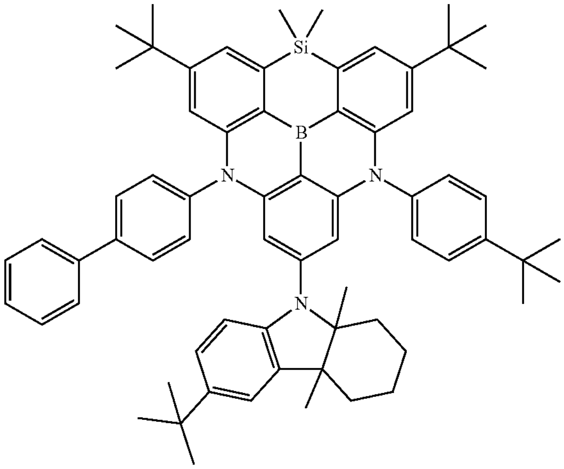
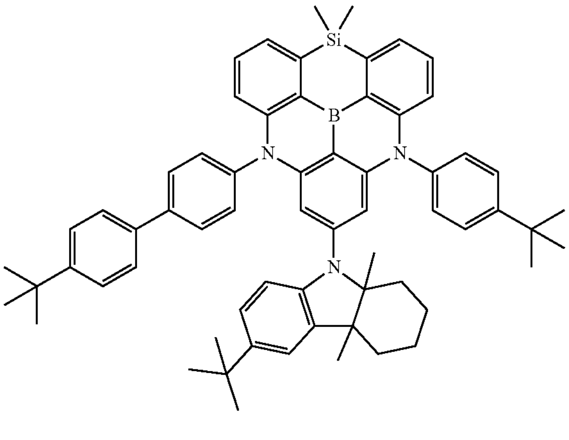
-continued
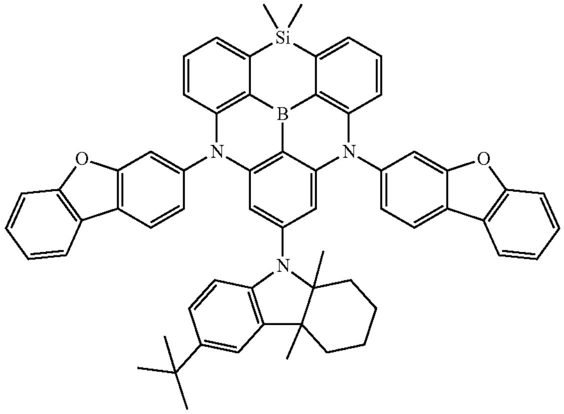
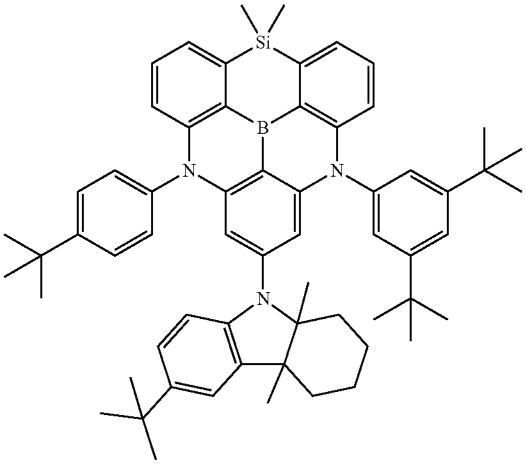
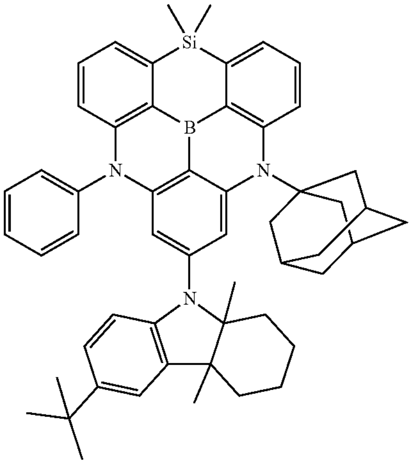

-continued
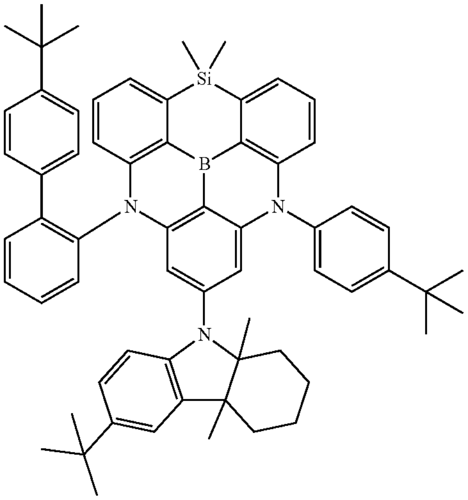
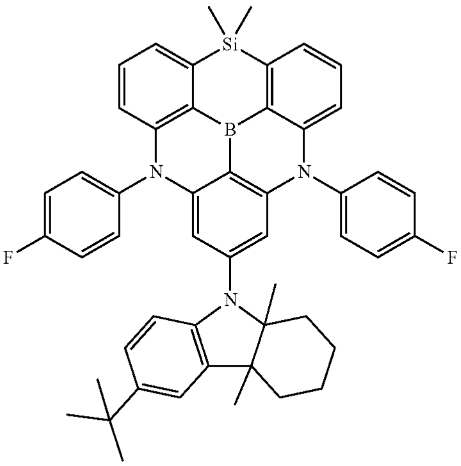
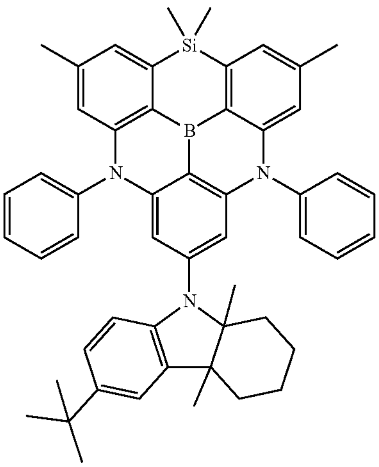
-continued
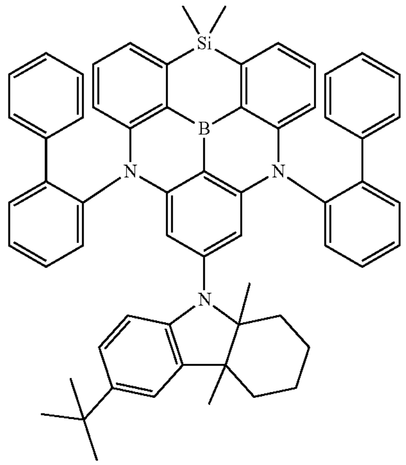
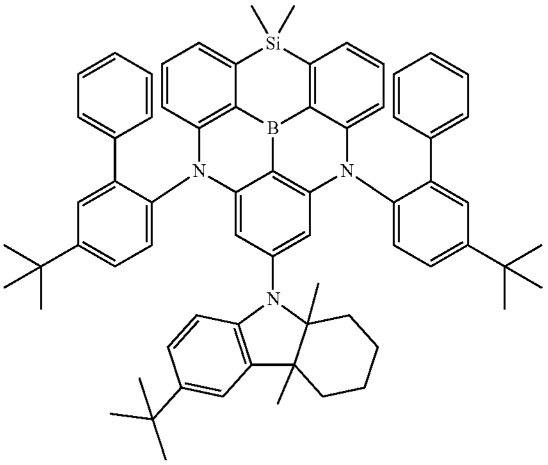
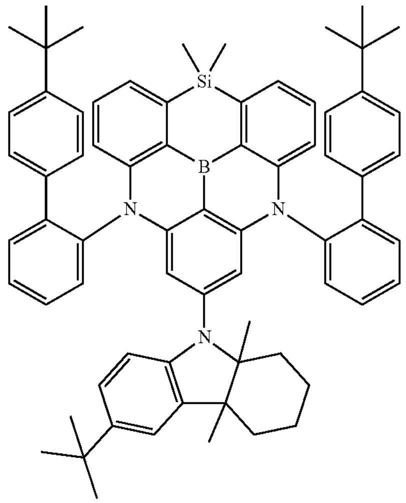

-continued
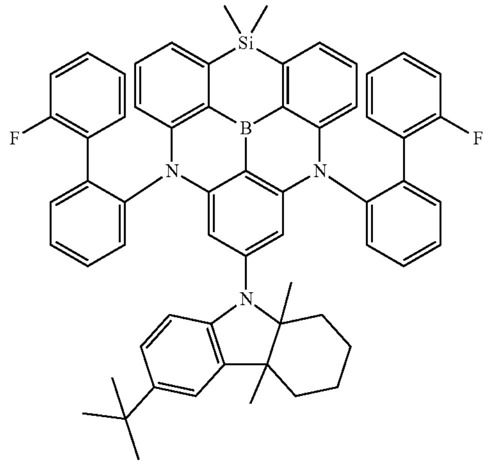
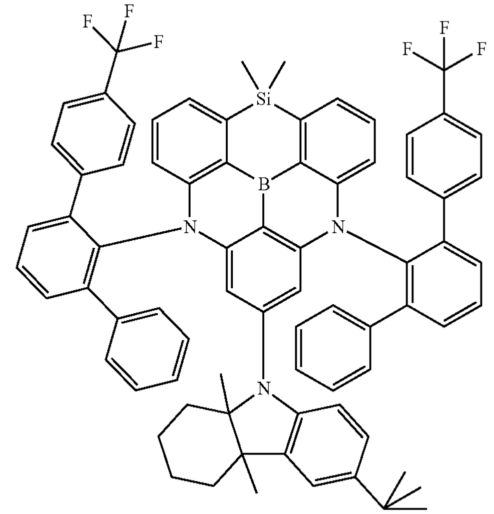
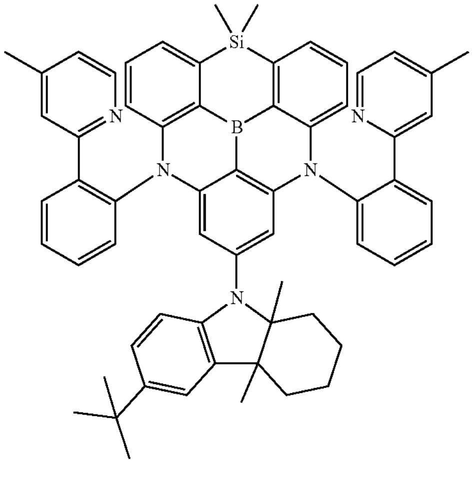
-continued
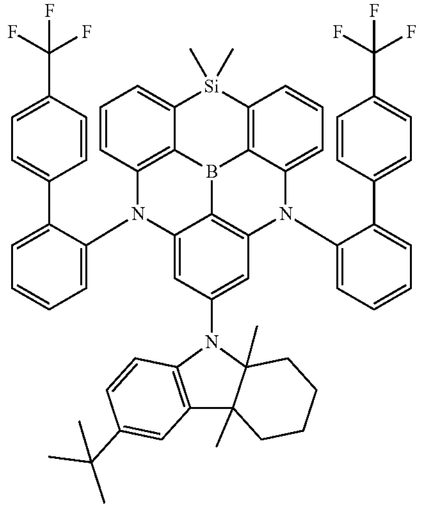
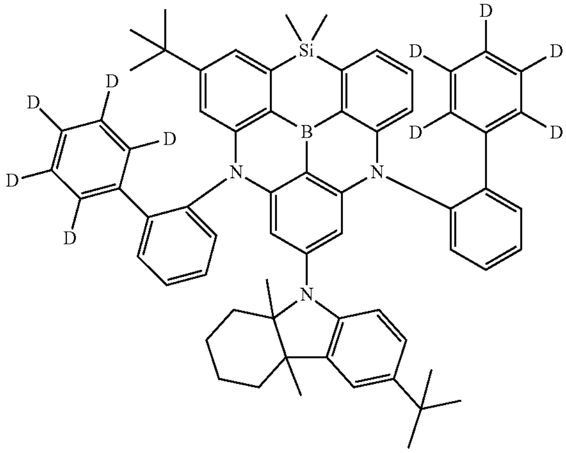
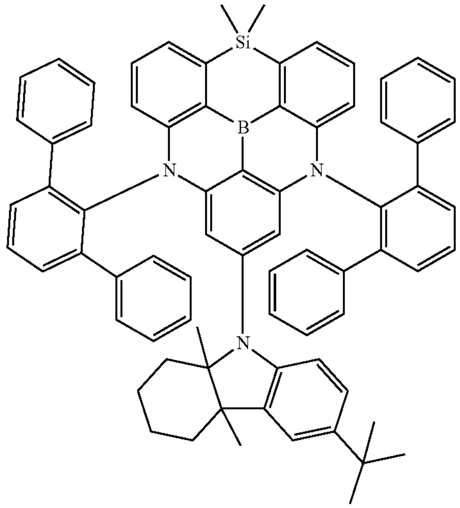

-continued
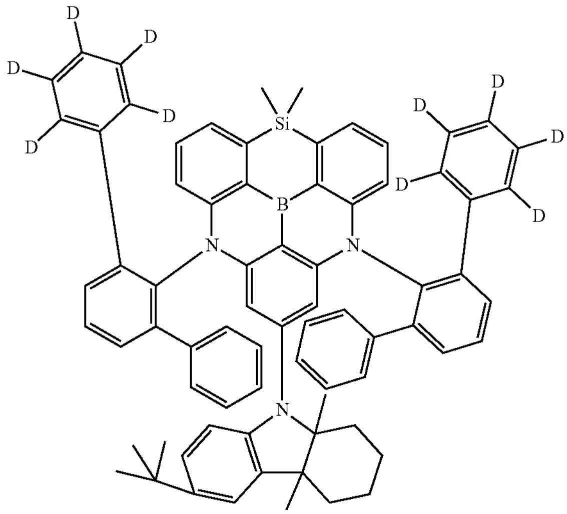
-continued
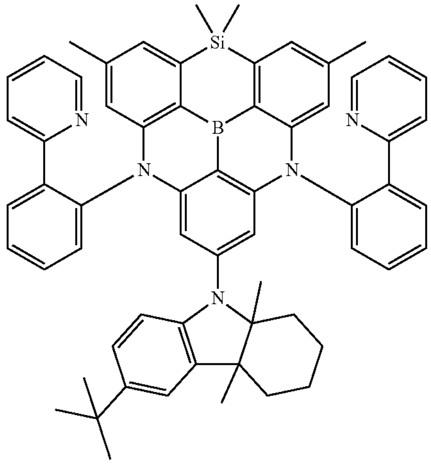
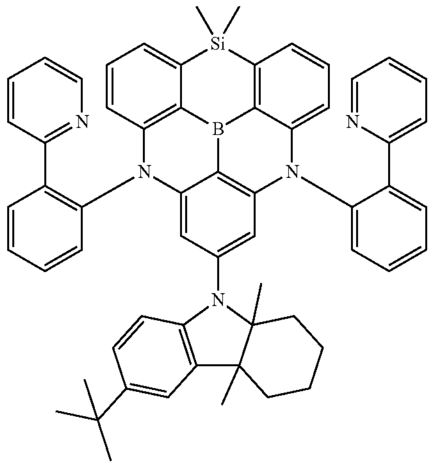
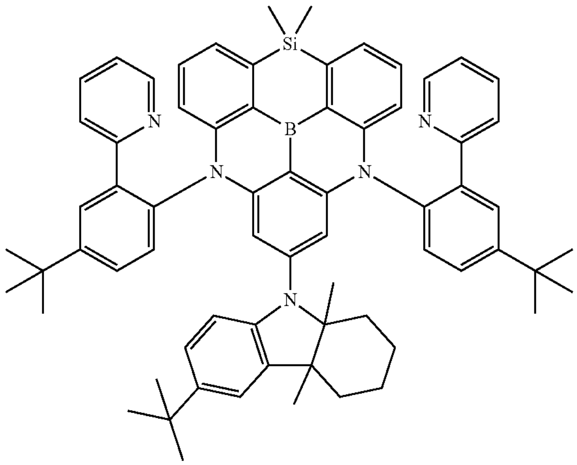
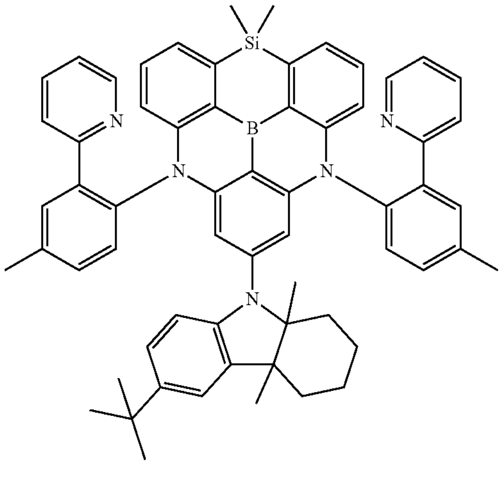
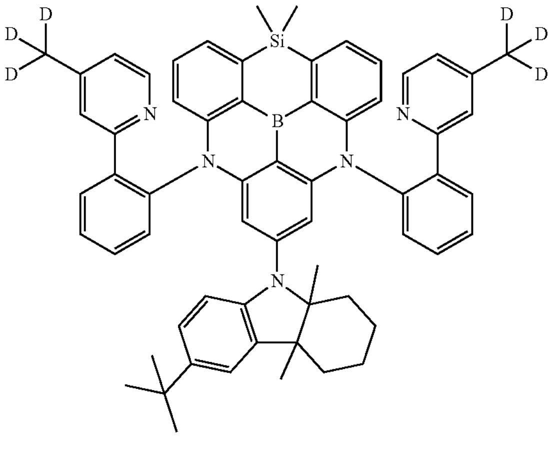

-continued
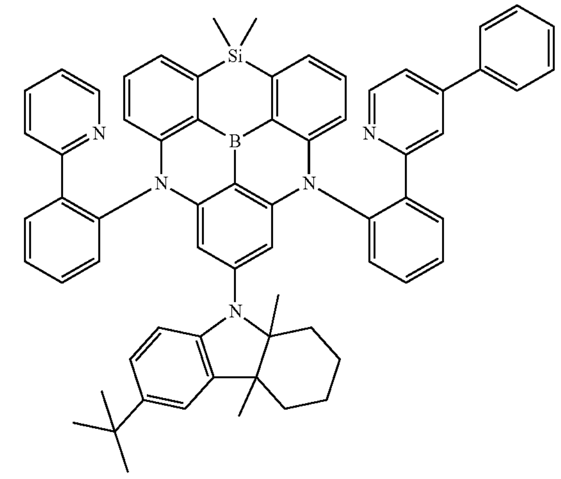
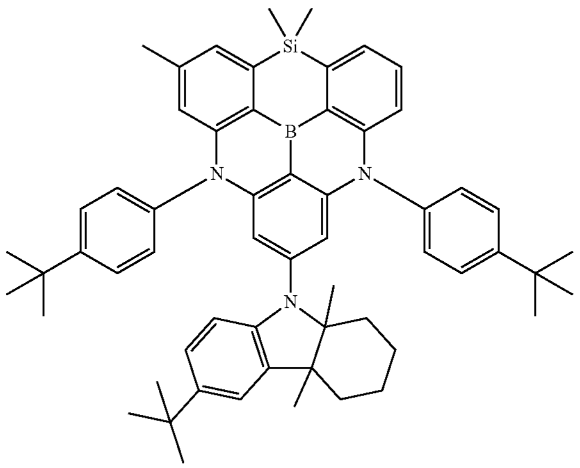
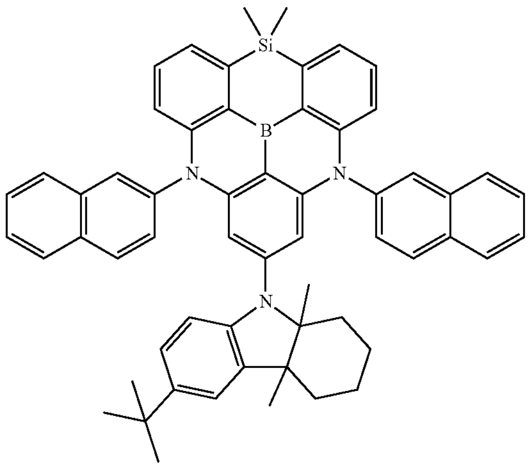
-continued
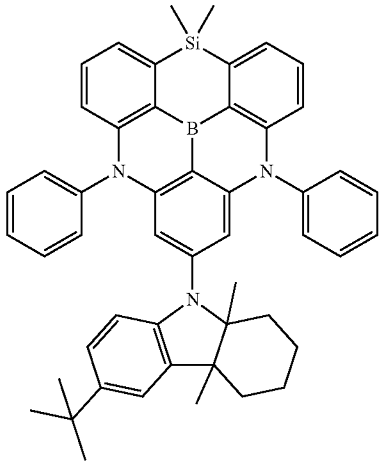
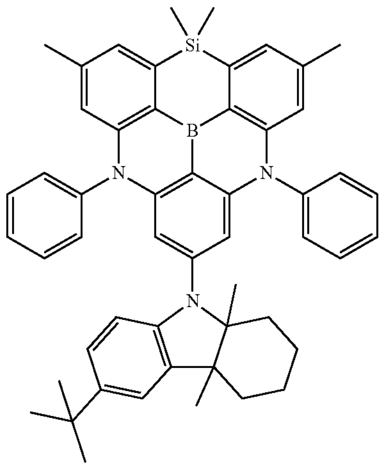
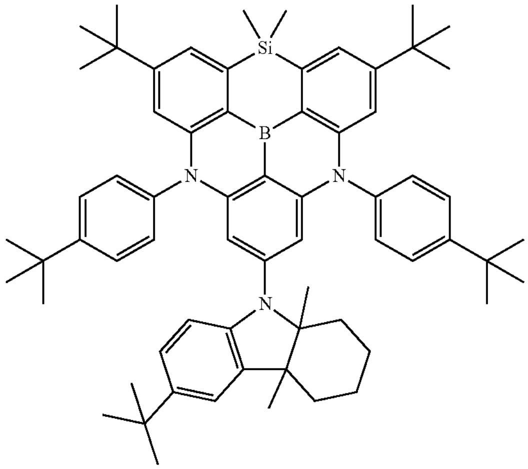

-continued
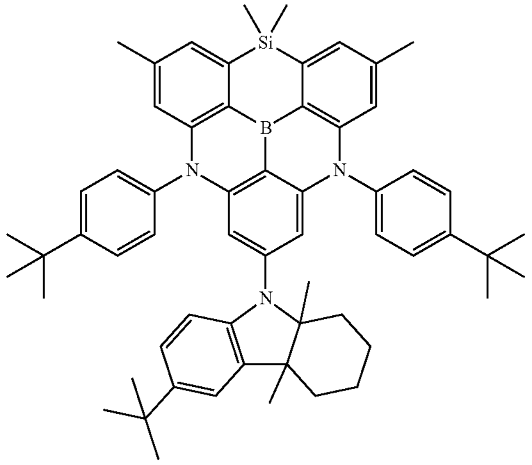
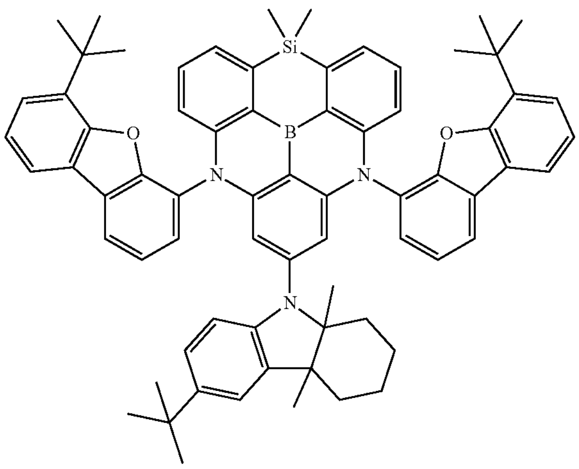
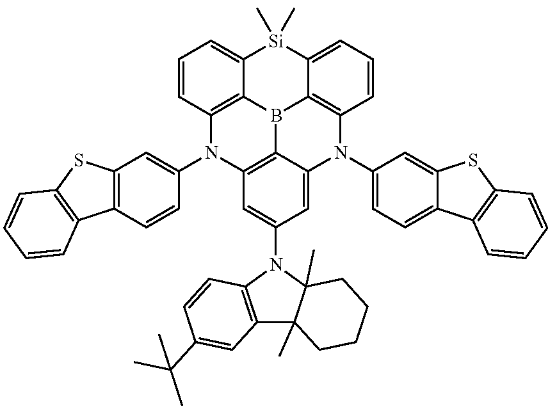
-continued
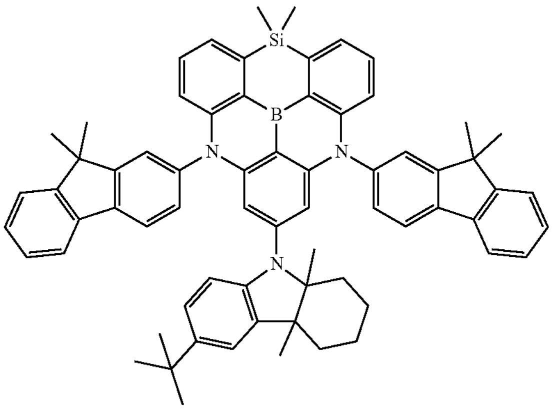
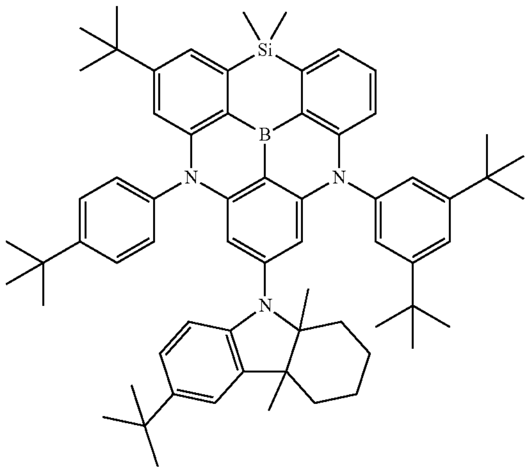
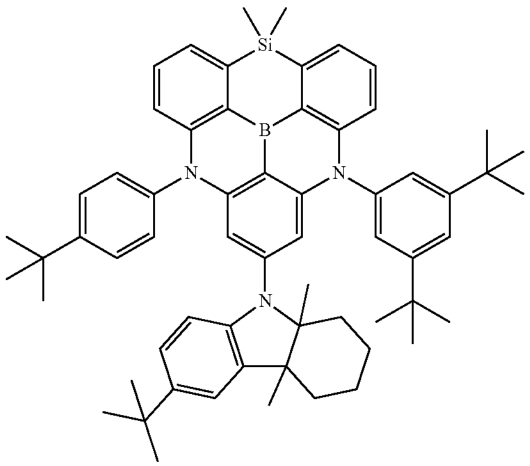

-continued
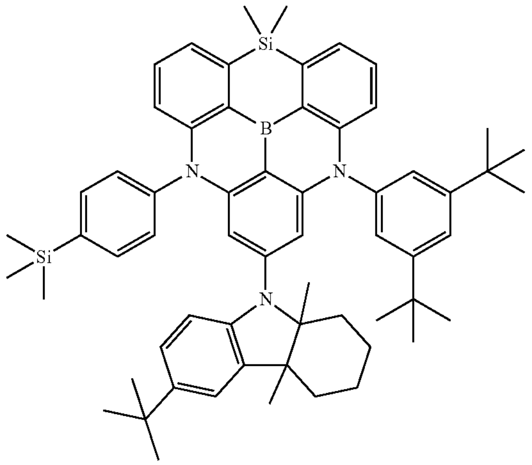
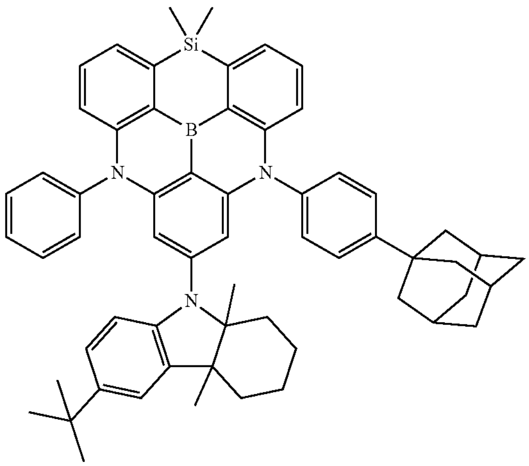
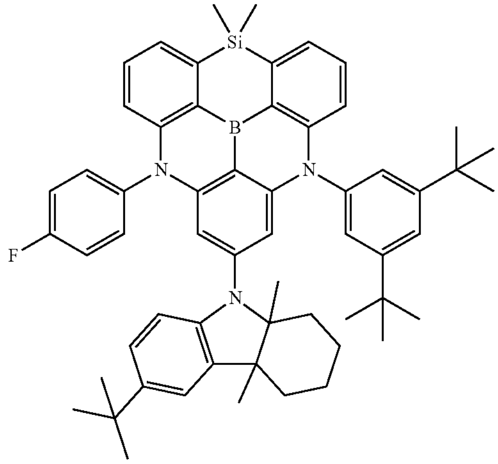
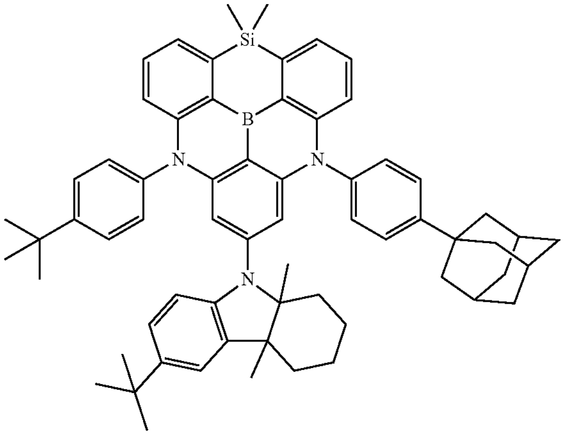
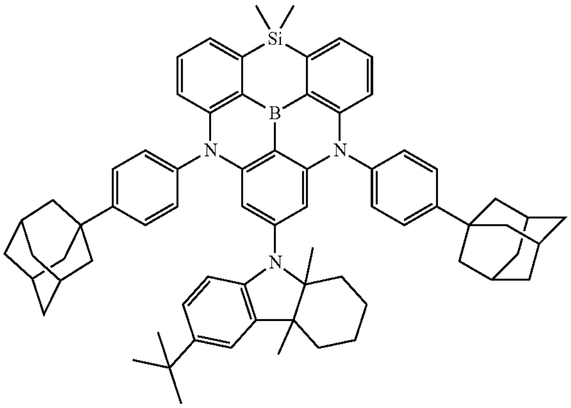
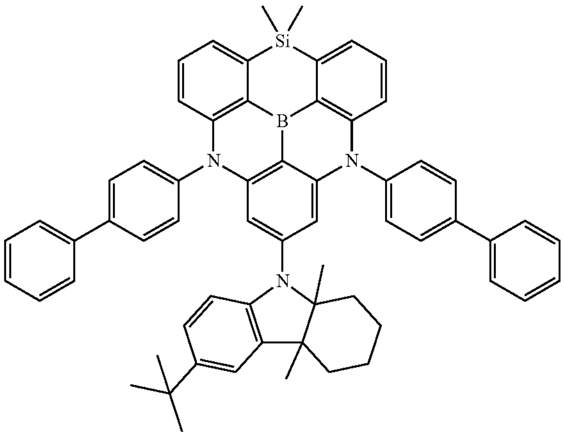

-continued
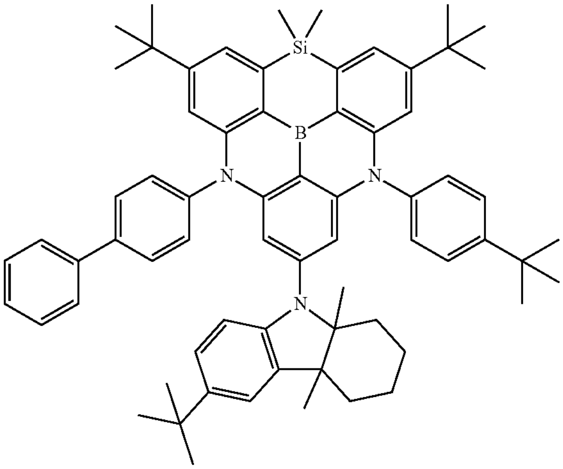
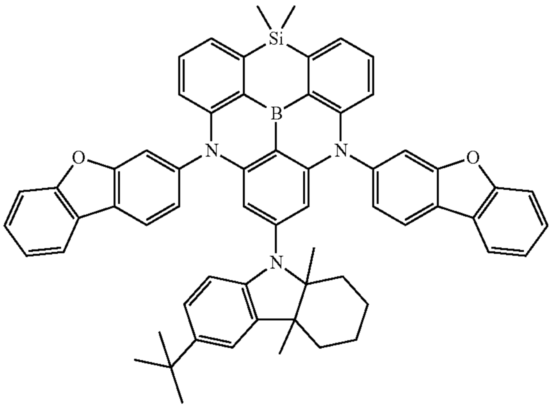
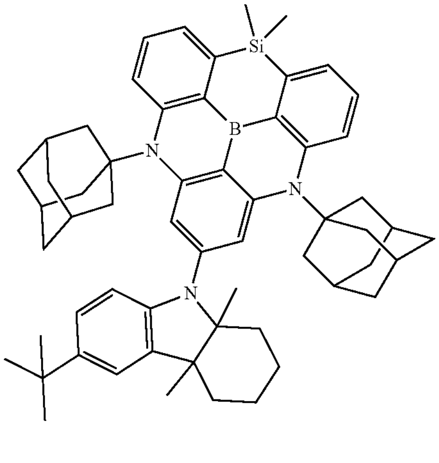
-continued
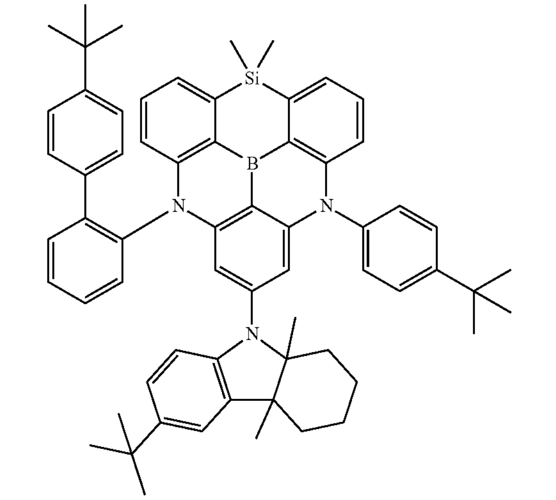
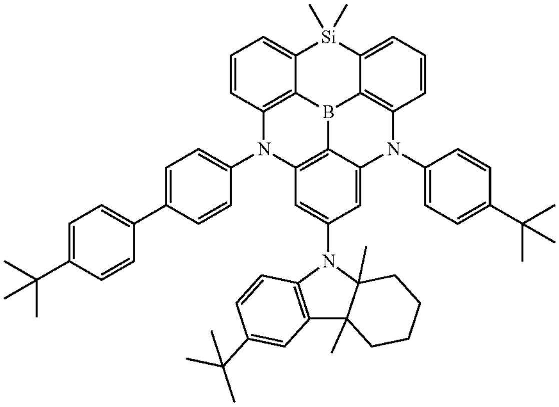
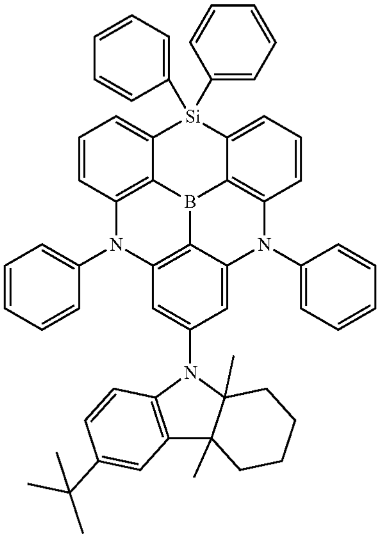

-continued
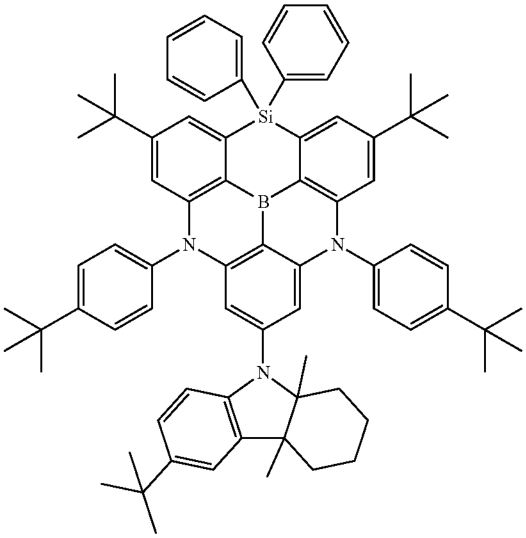
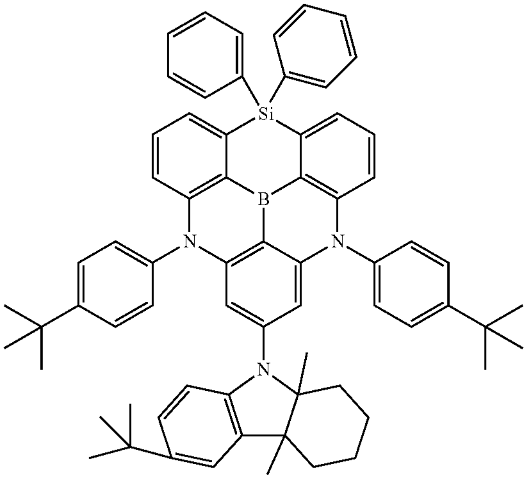
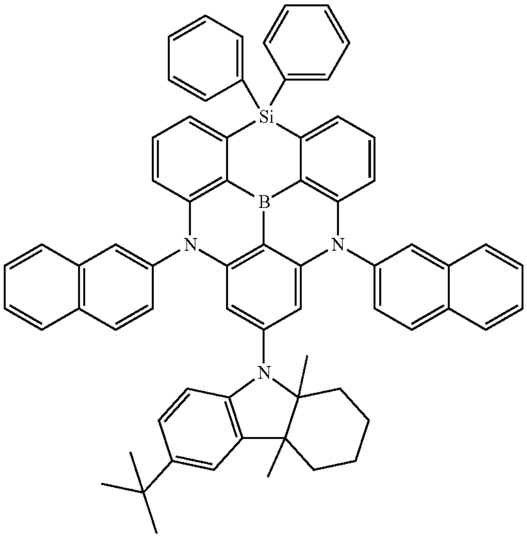
-continued
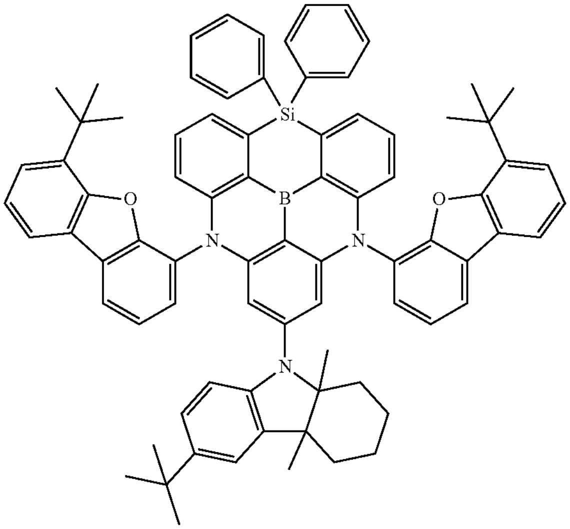
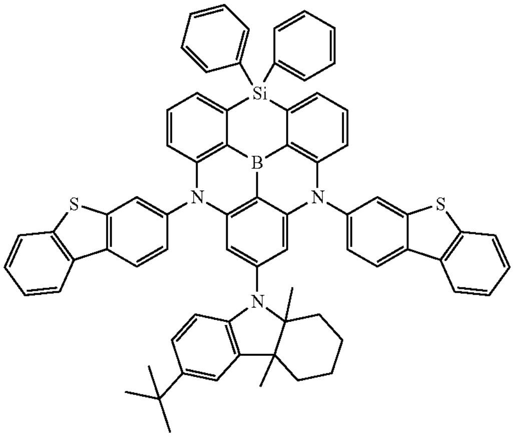
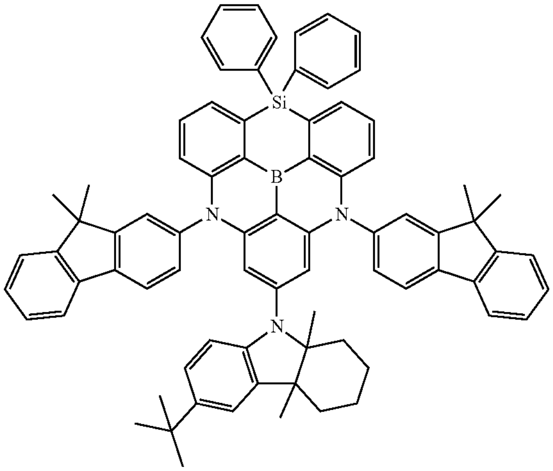

-continued
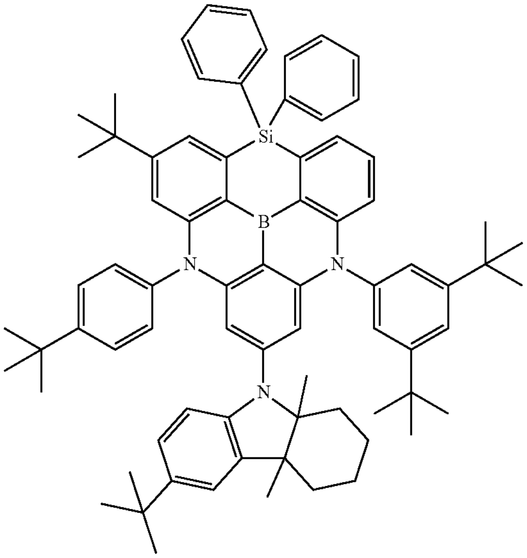
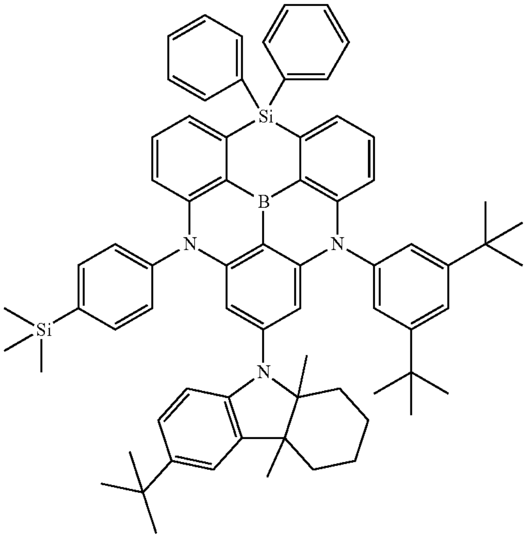
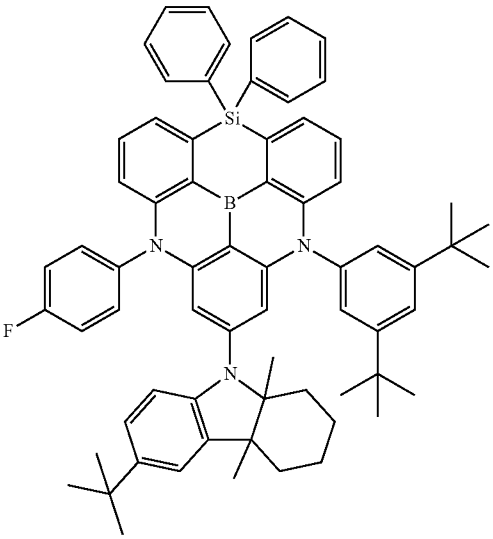
-continued
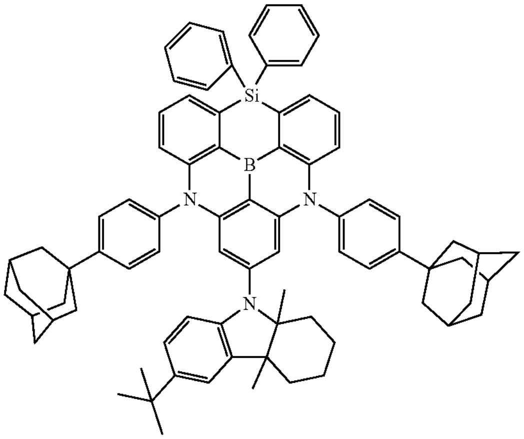
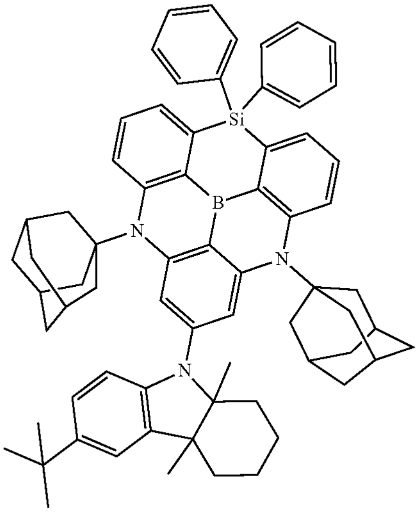
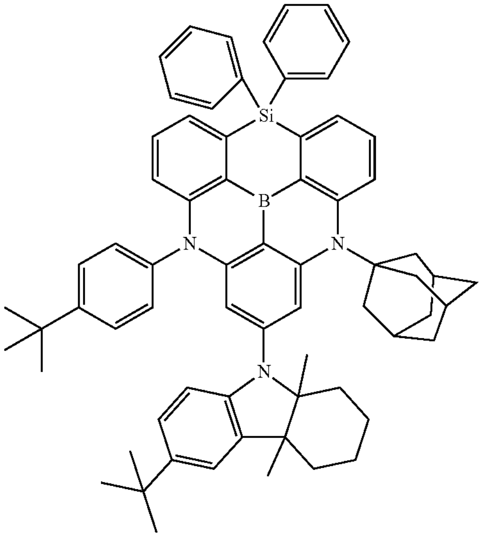

-continued
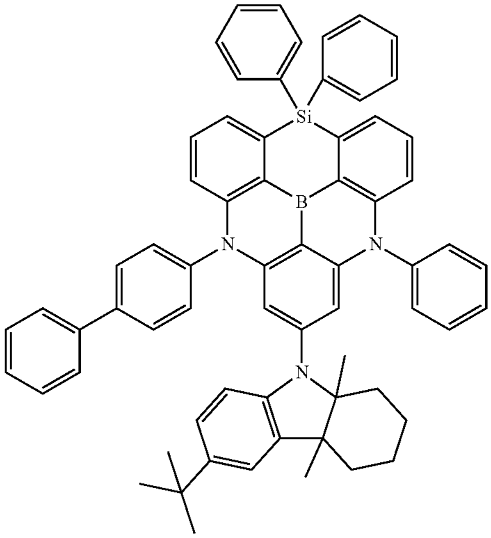
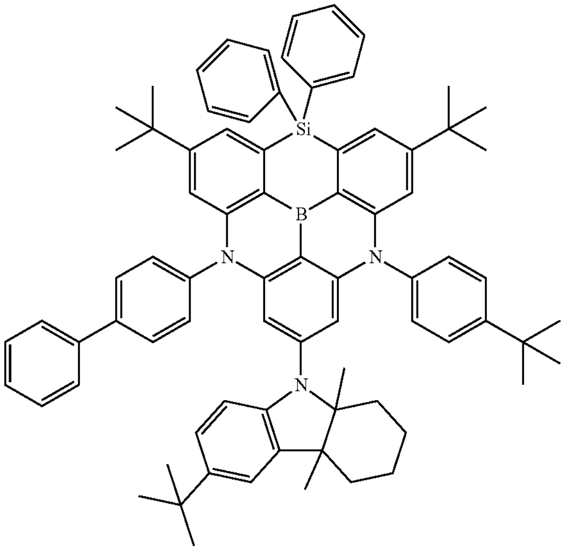
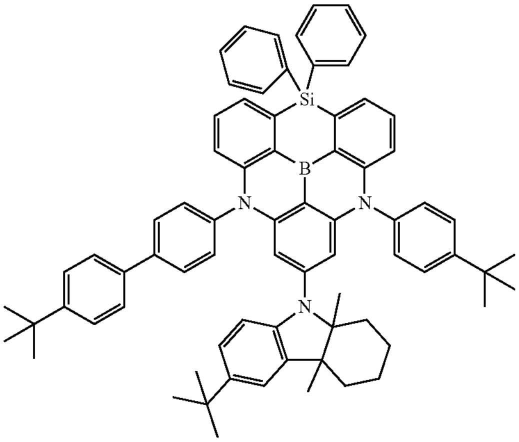
-continued
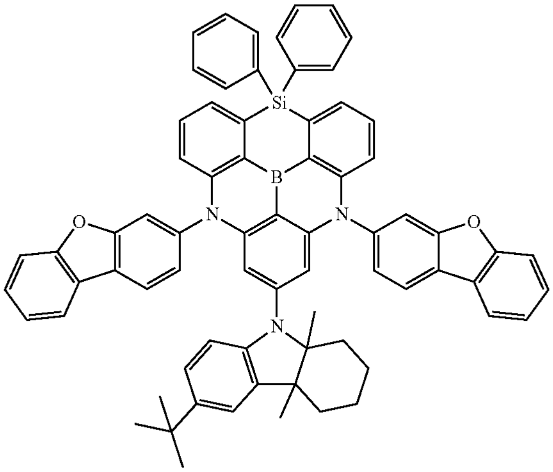
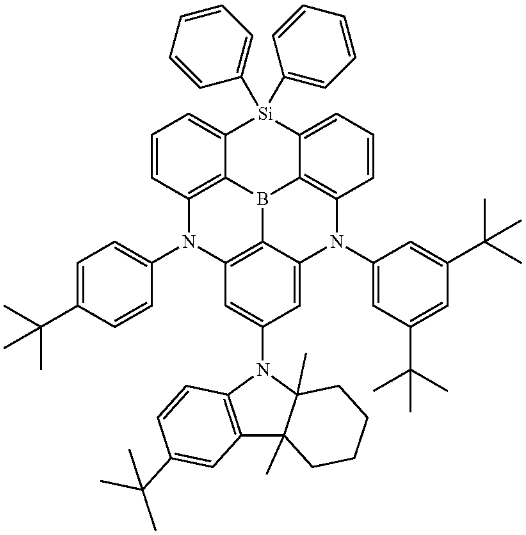
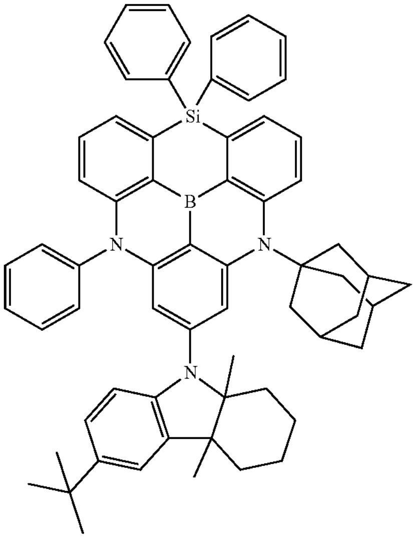

-continued
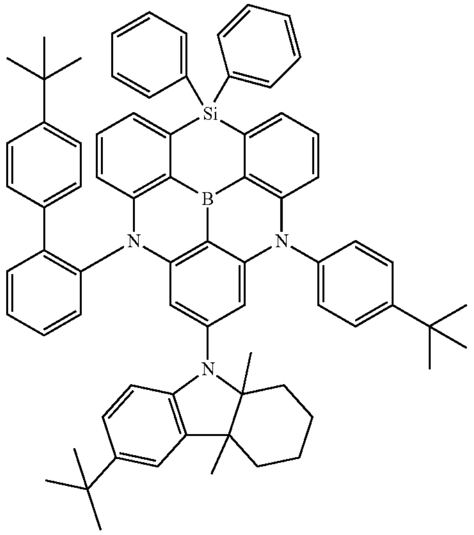
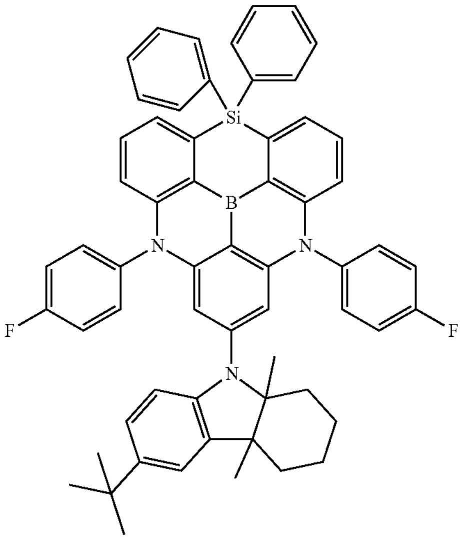
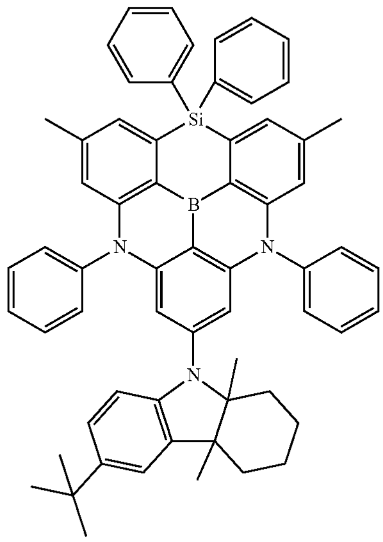
-continued
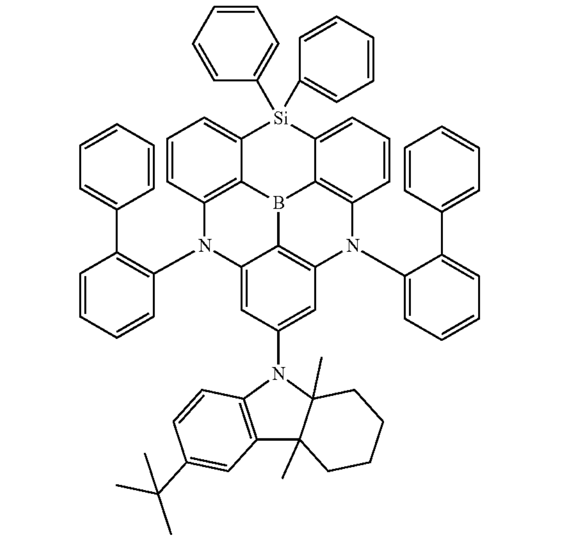
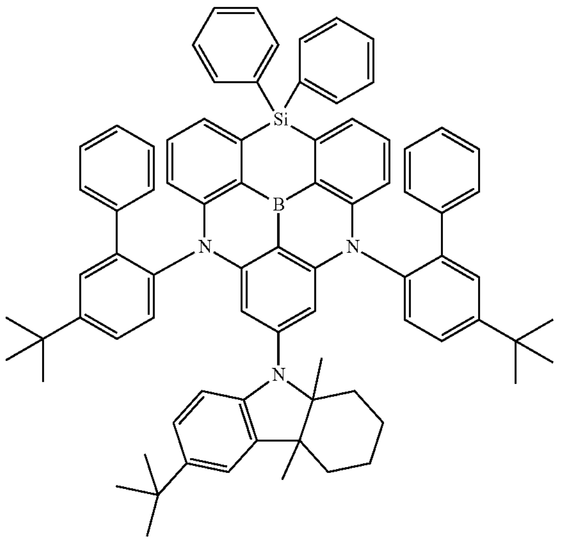
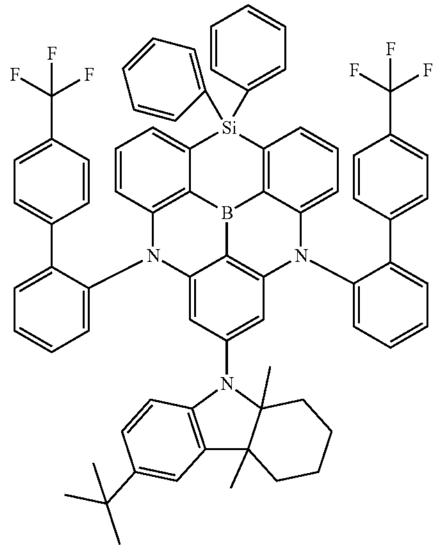

-continued
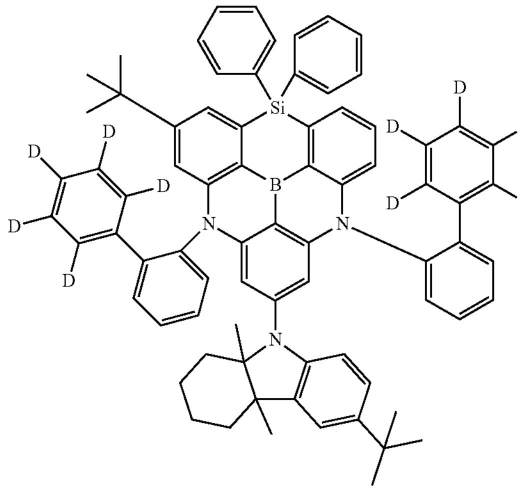
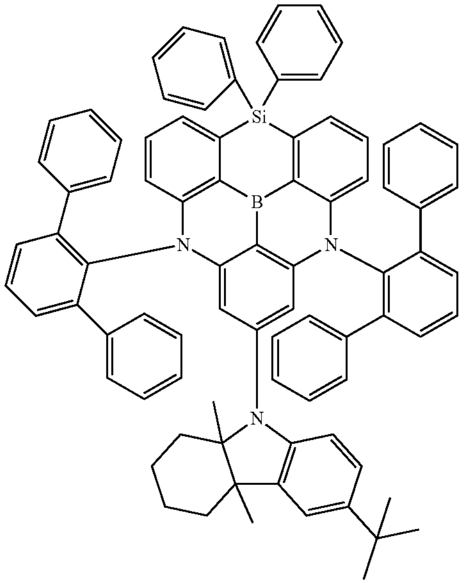
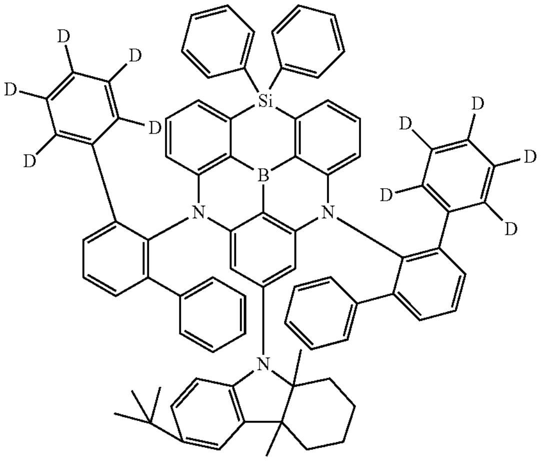
-continued
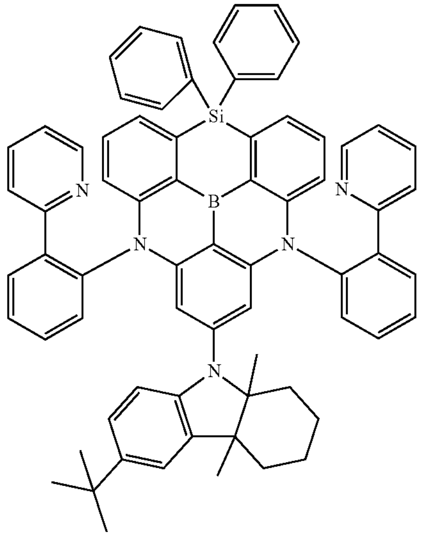
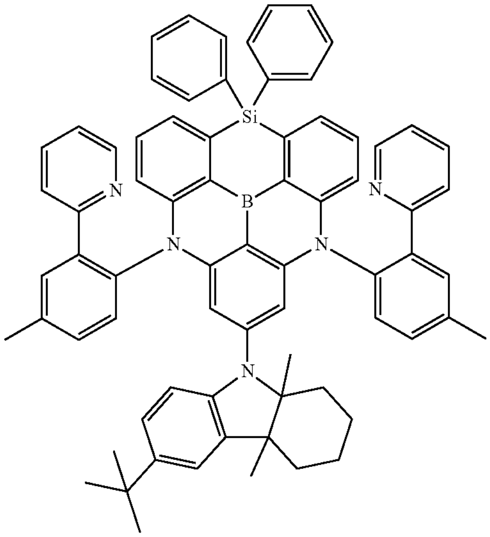
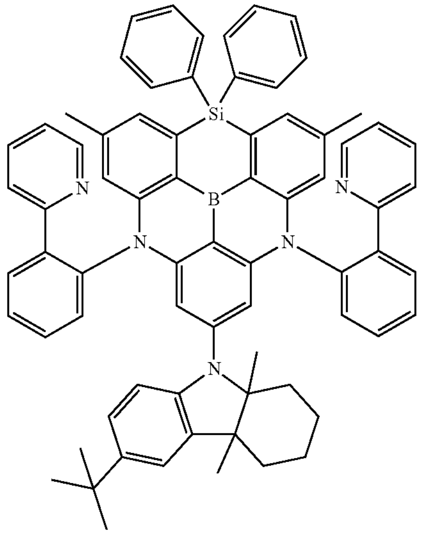

-continued
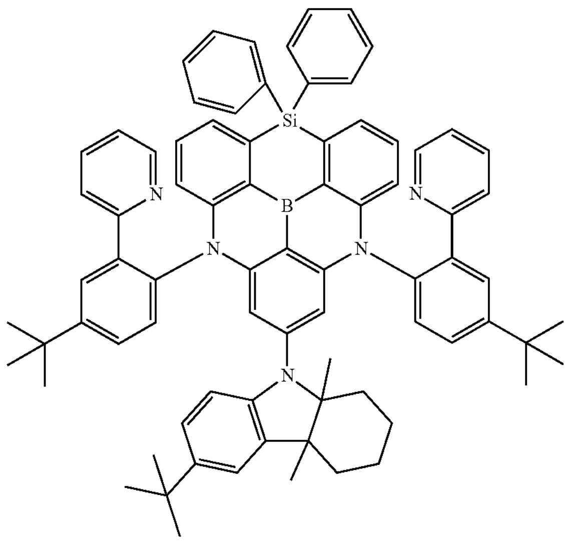
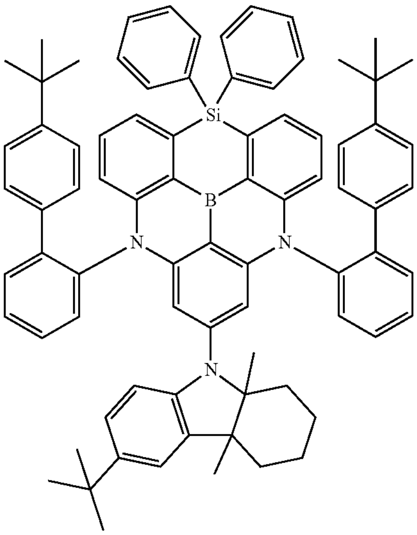
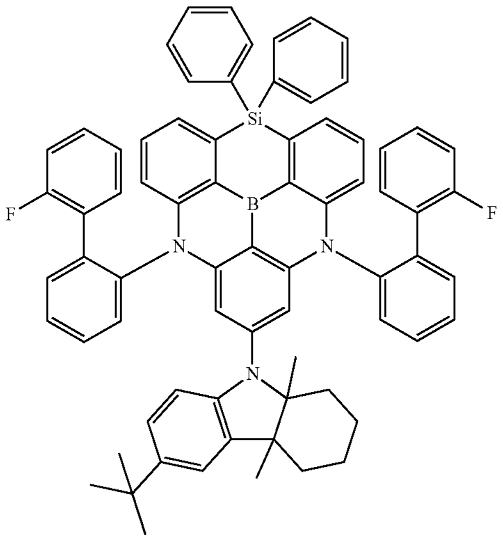
-continued
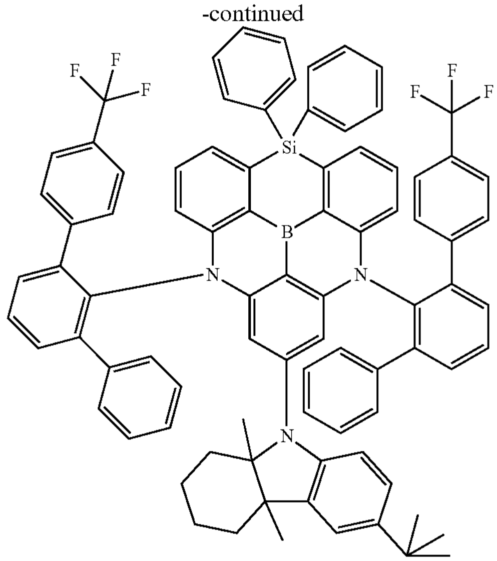
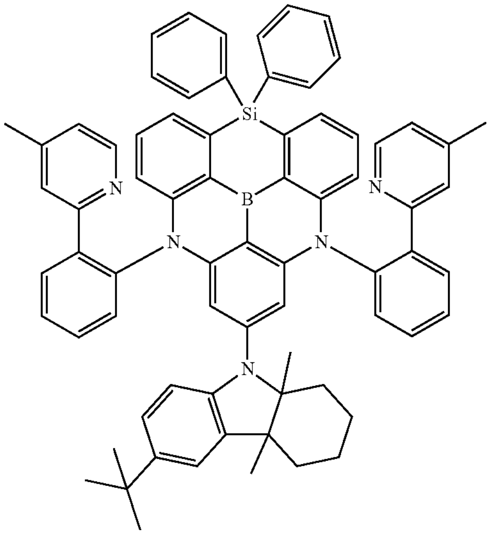
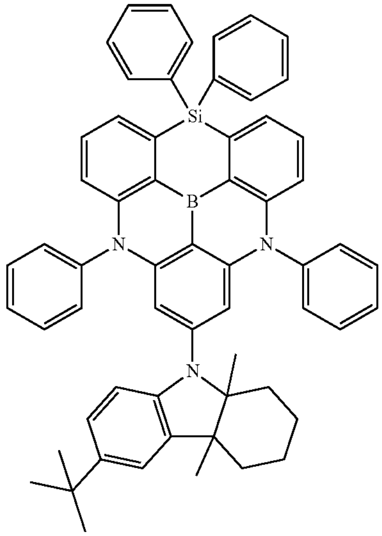

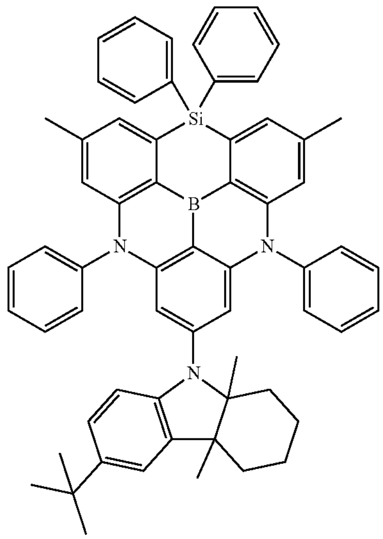
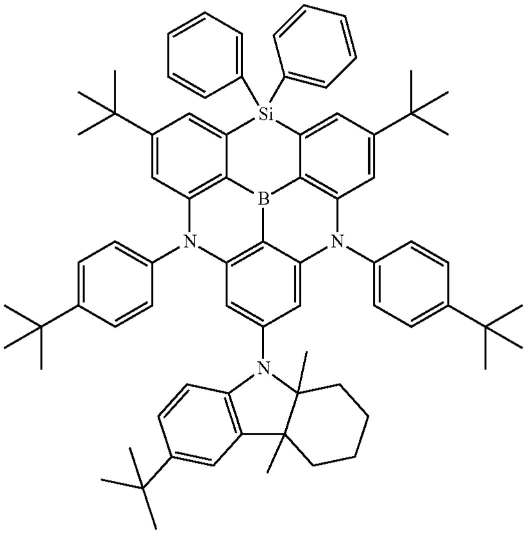
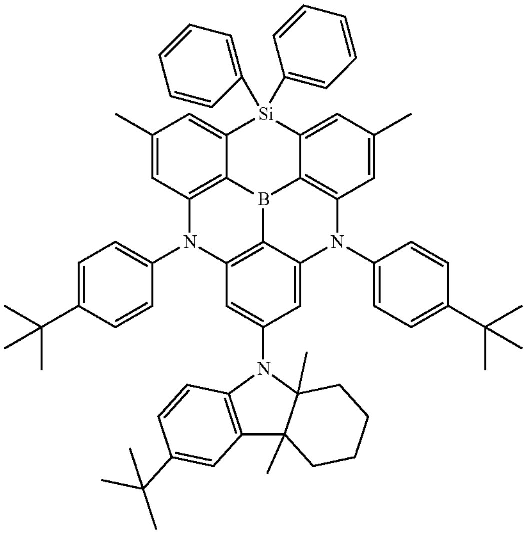
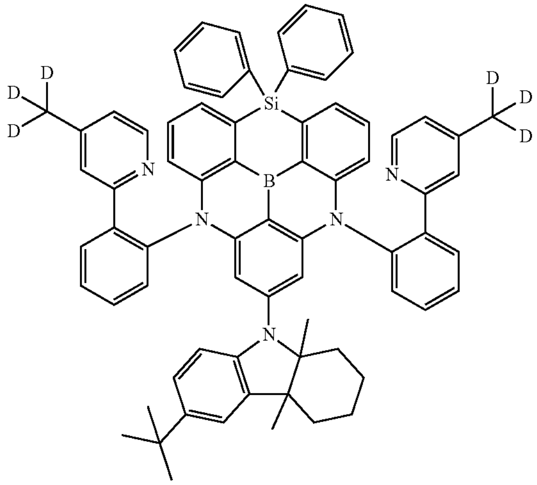
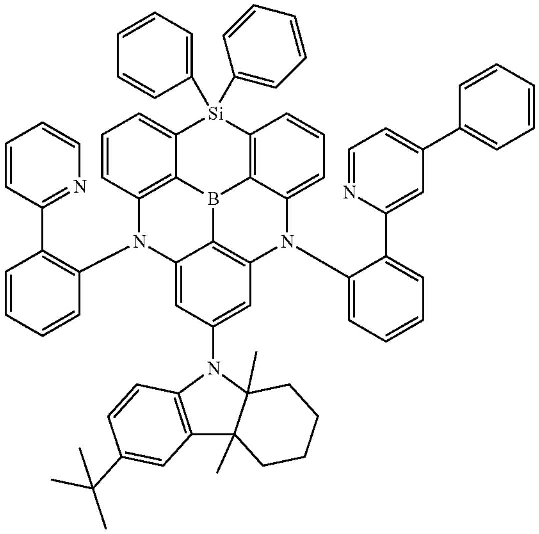
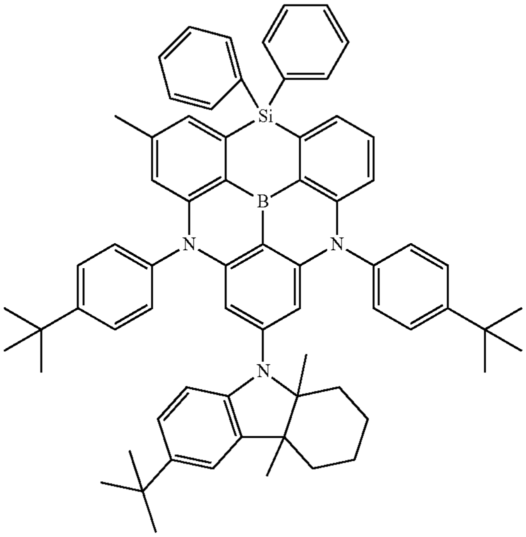

-continued
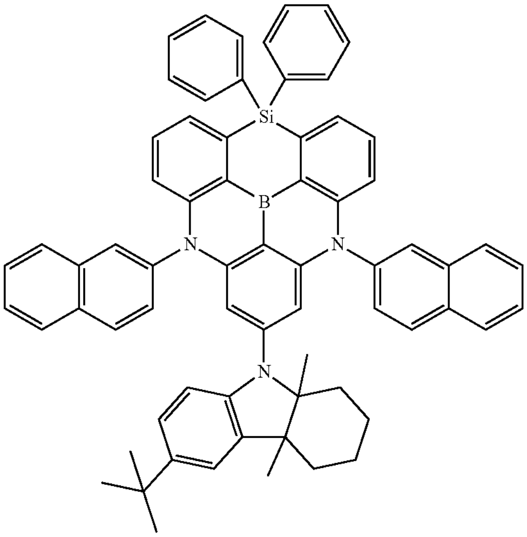
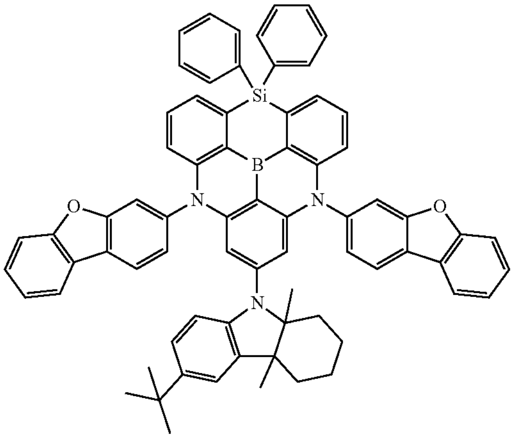
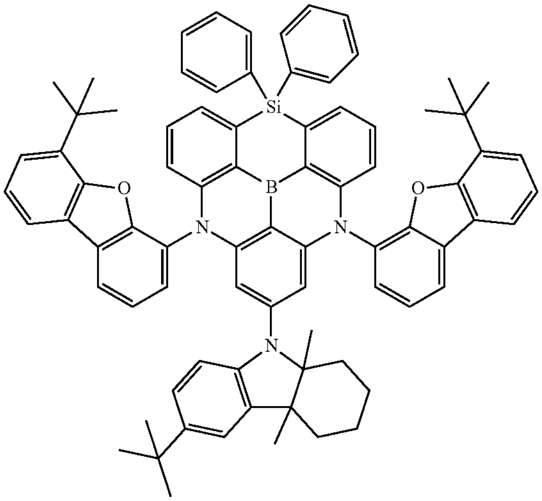
-continued
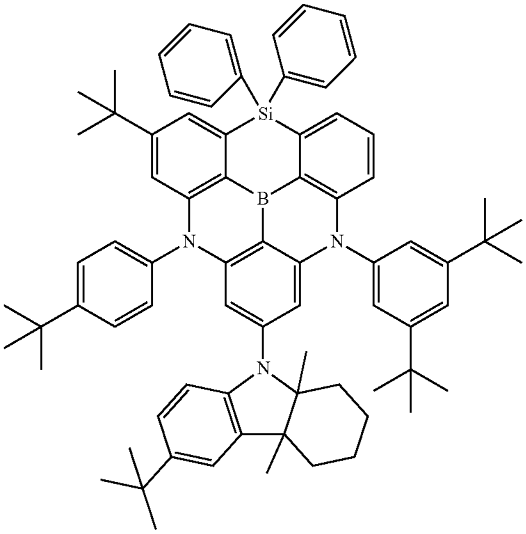
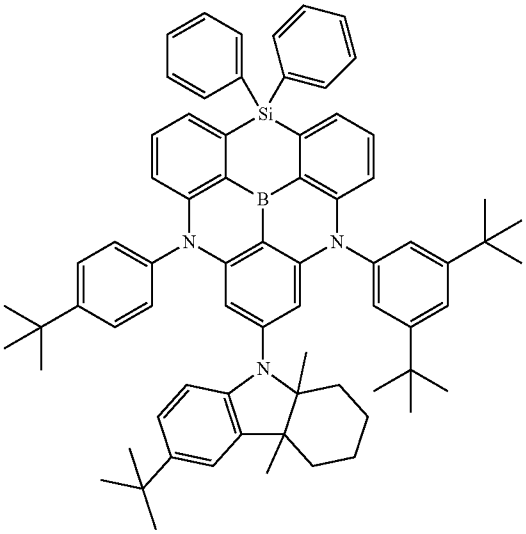
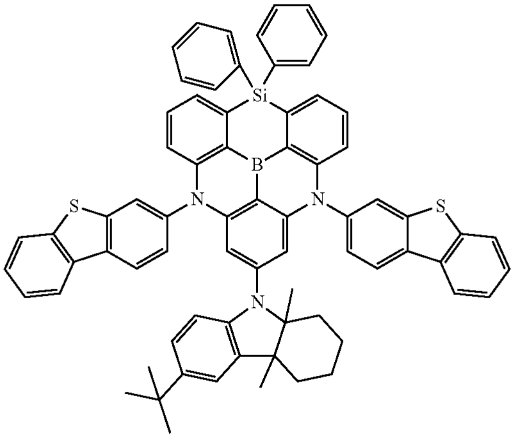

-continued
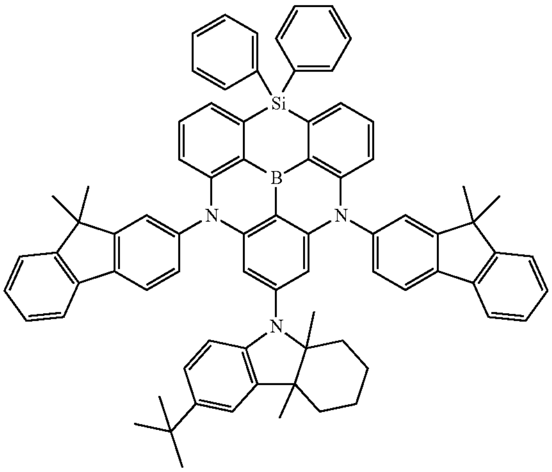
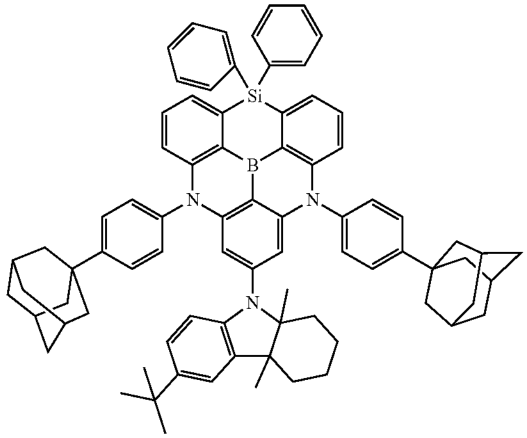
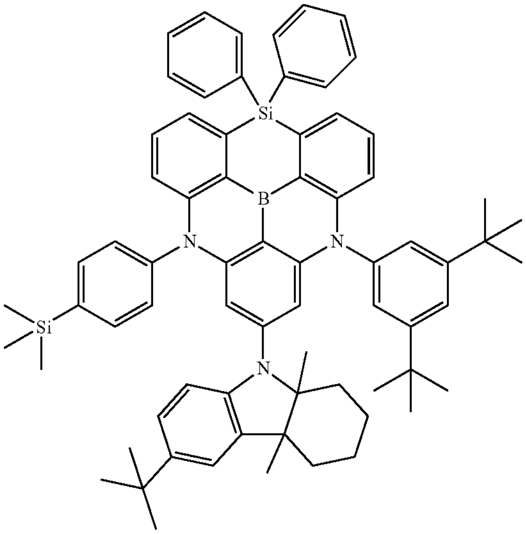
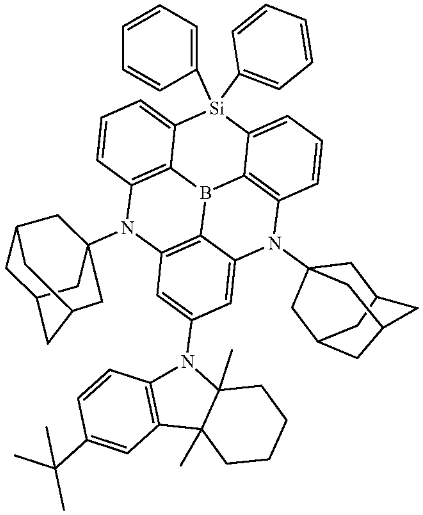
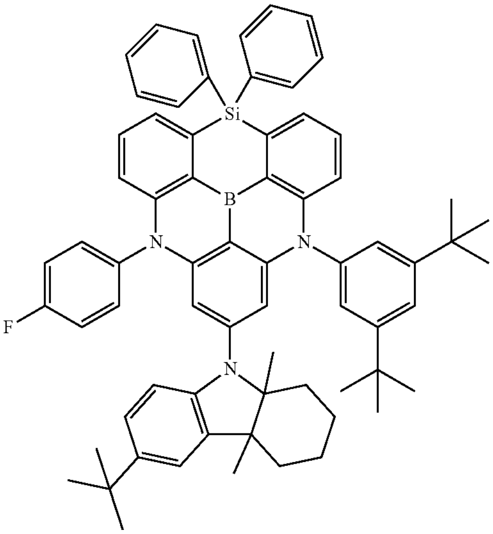
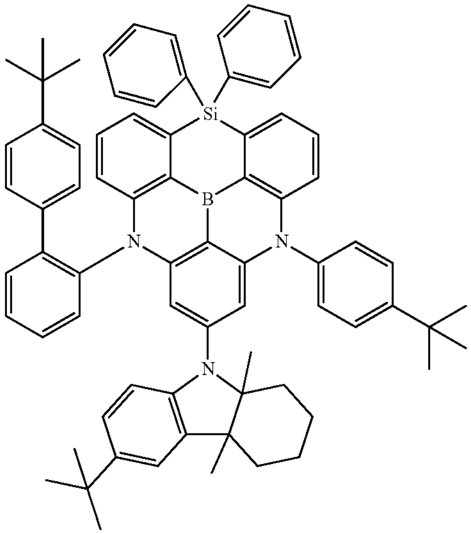 [SMILES: CC(C)(C)c1ccc(-c2ccccc2N2c3cc(N4c5ccc(C(C)(C)C)cc5C5(C)CCCCC45C)cc4c3B3c5c(cccc5[Si](c5ccccc5)(c5ccccc5)c5cccc2c53)N4c2ccc(C(C)(C)C)cc2)cc1]

-continued
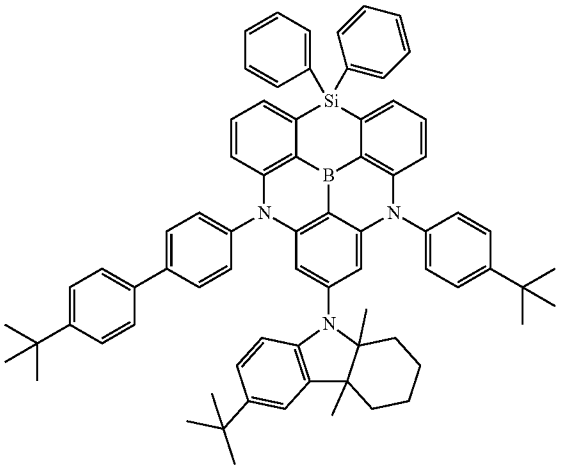
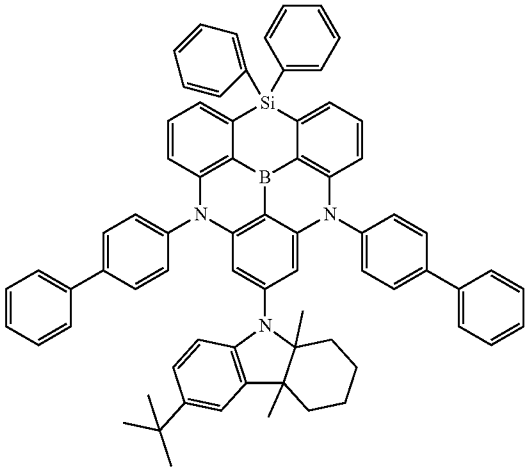
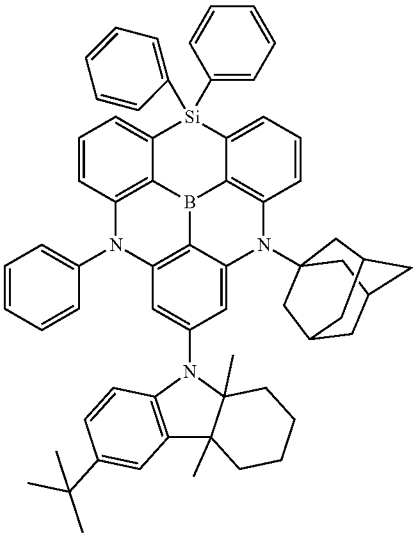
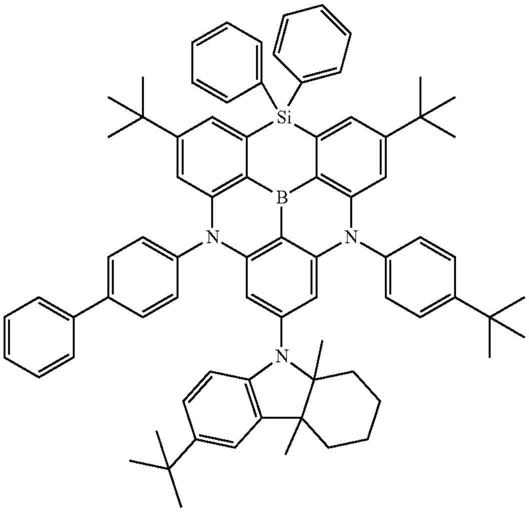
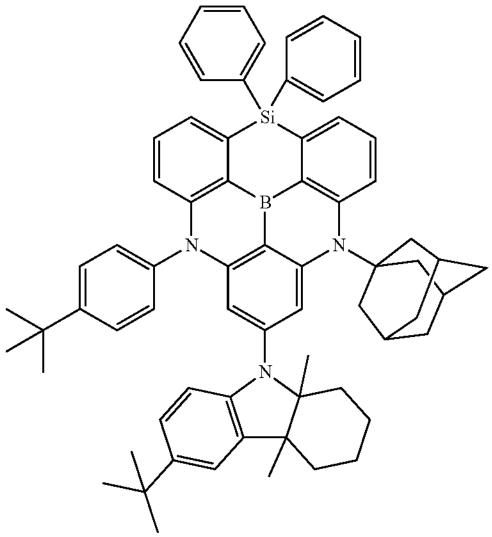
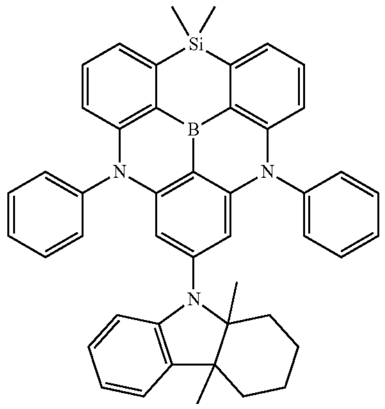

-continued
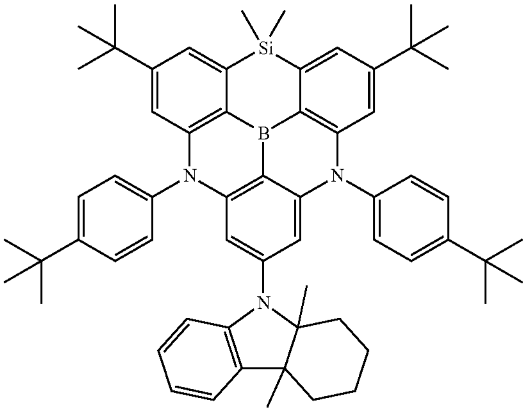
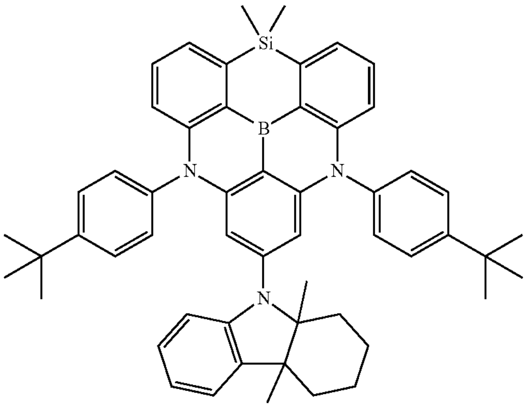
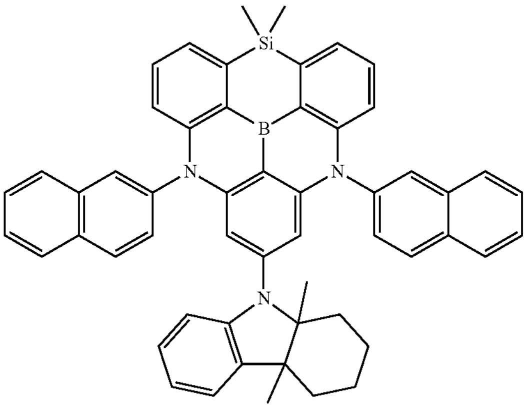
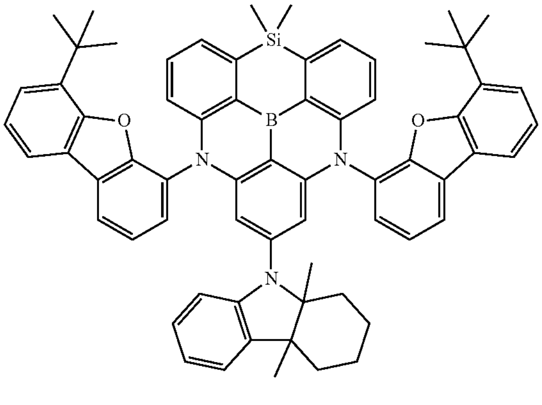
-continued
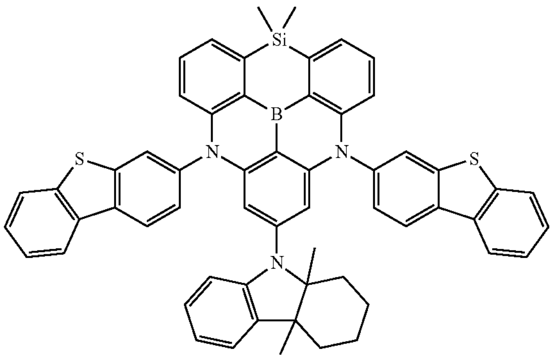
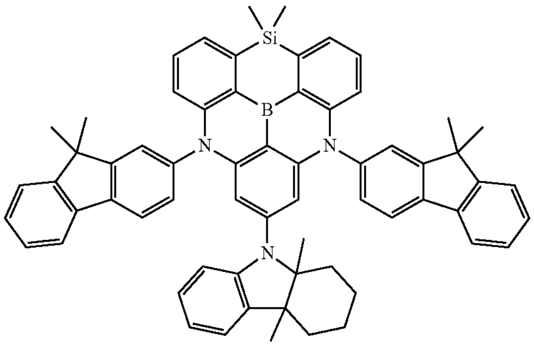
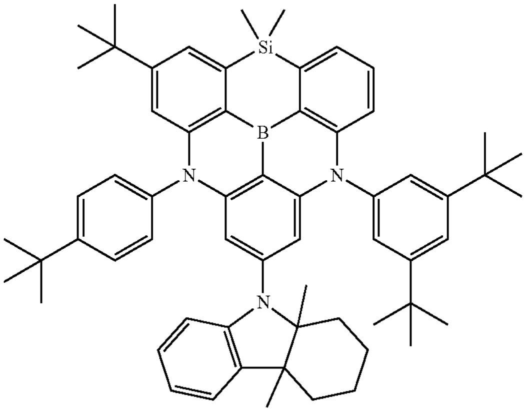
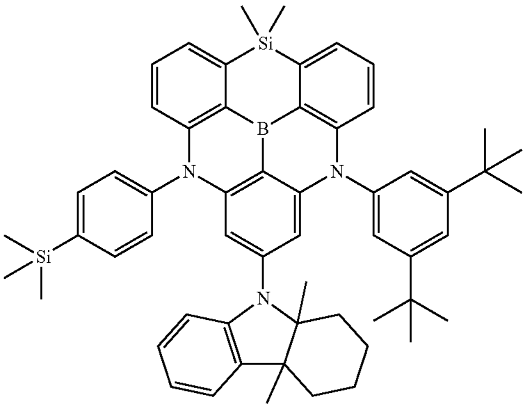

-continued
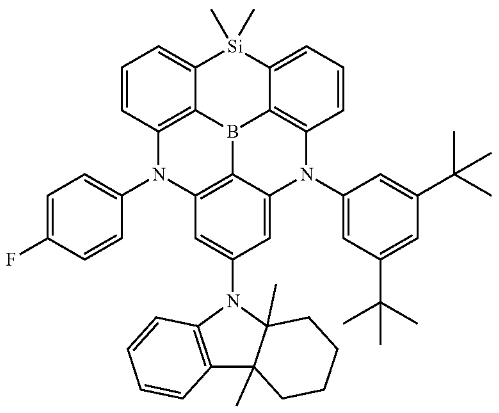
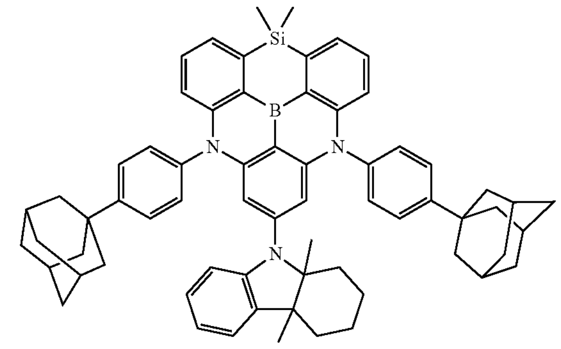
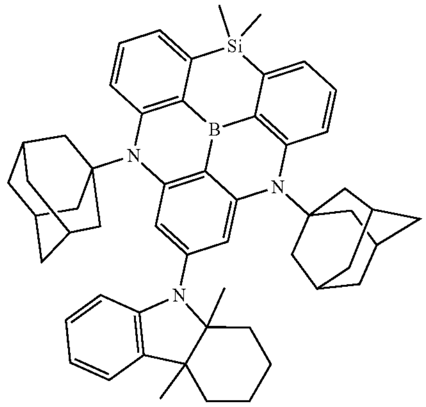
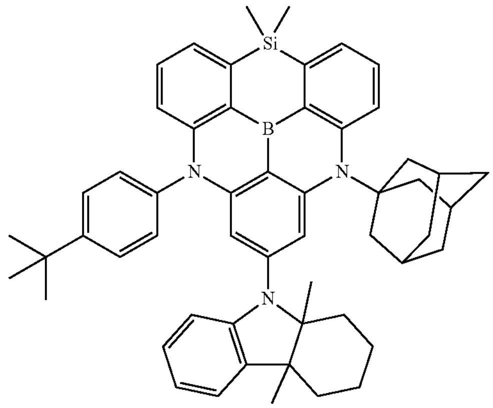
-continued
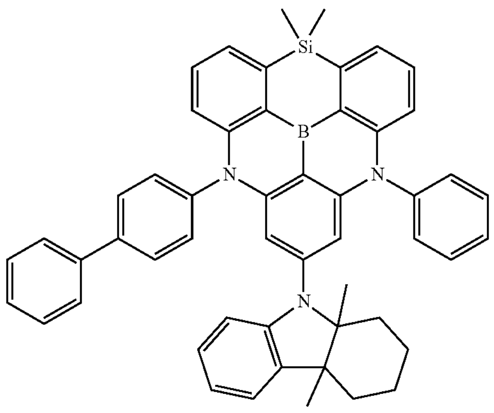
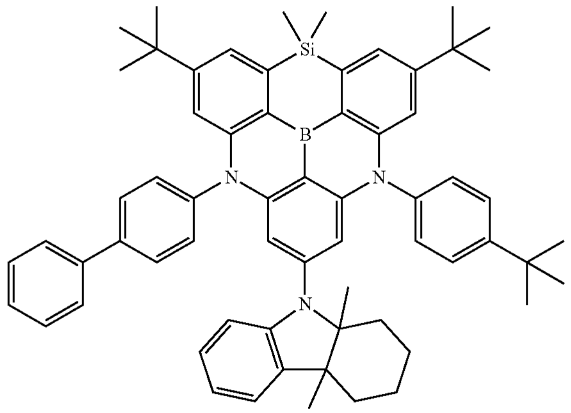
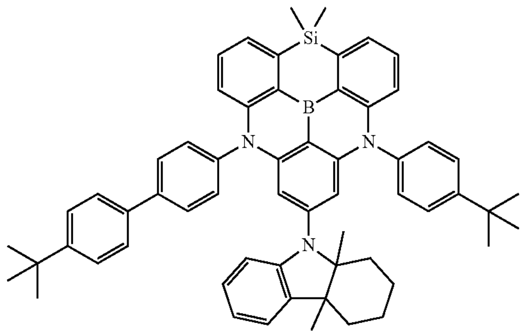
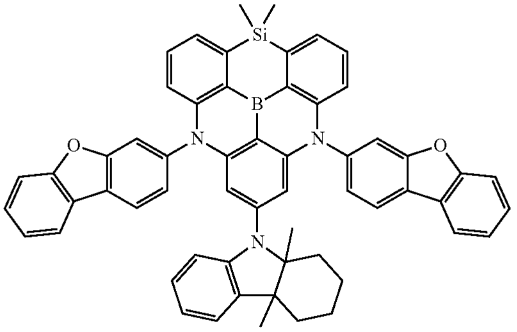

-continued
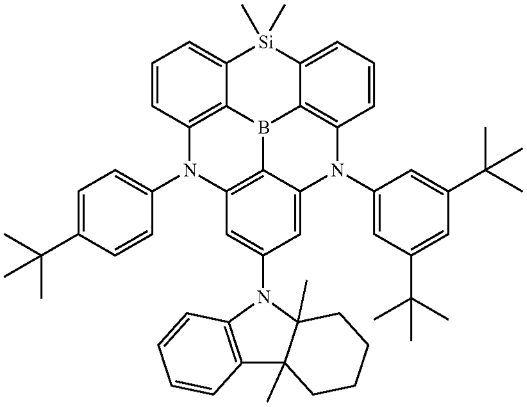
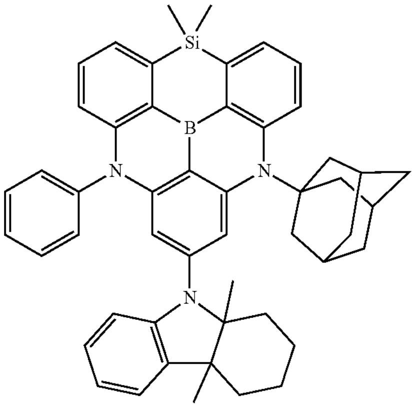
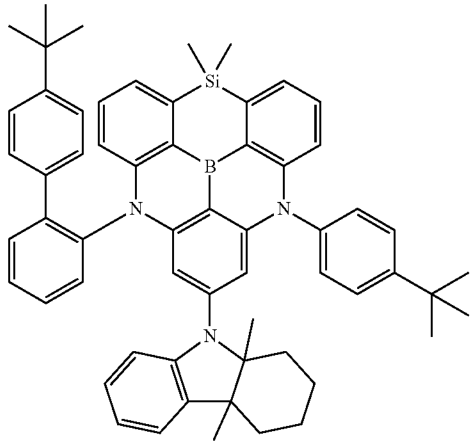
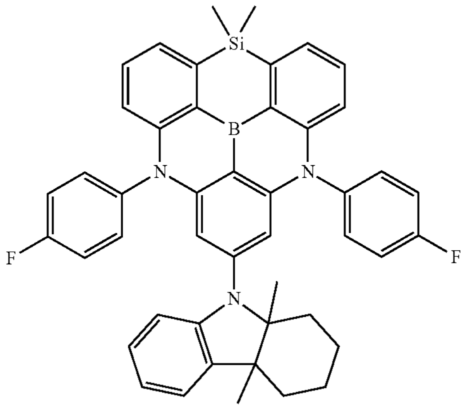
-continued
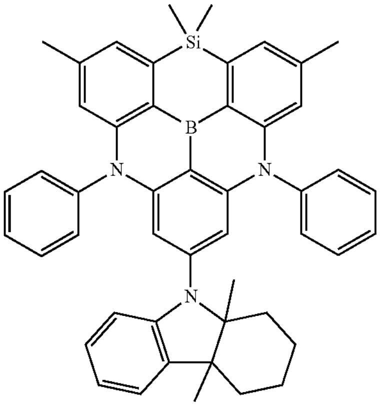
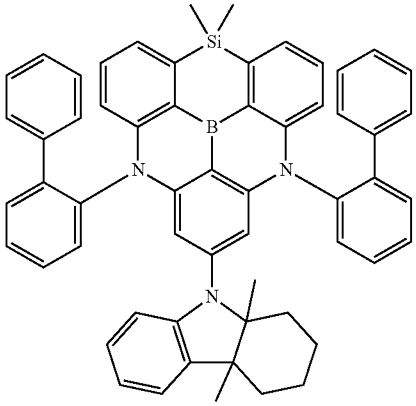
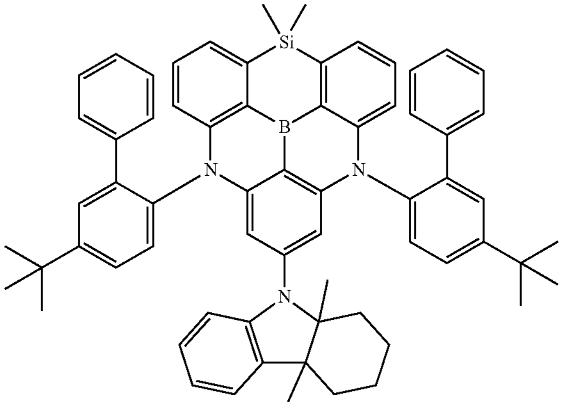
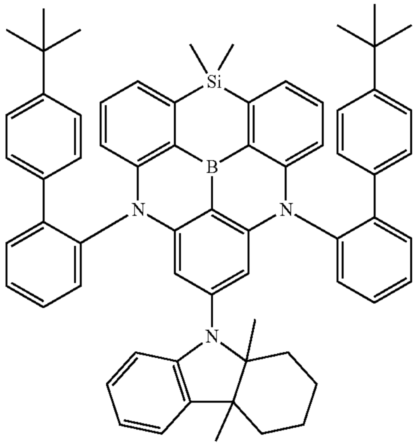

-continued
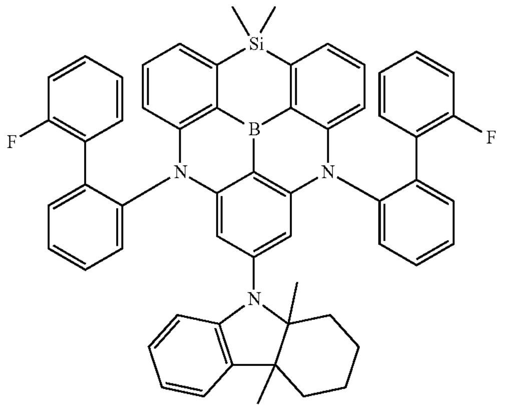
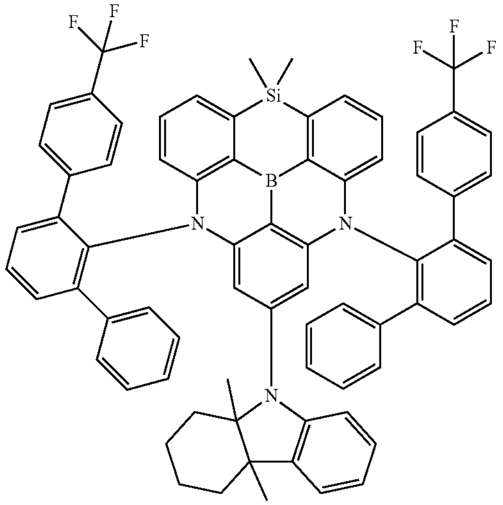
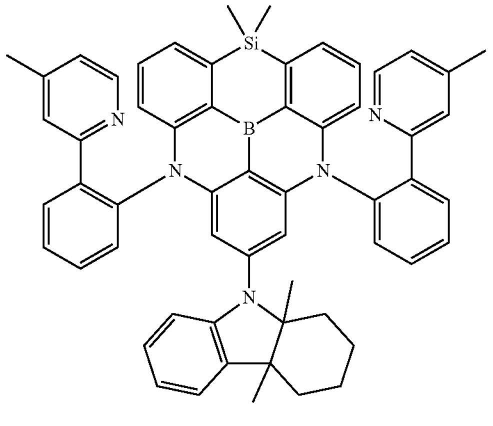
-continued
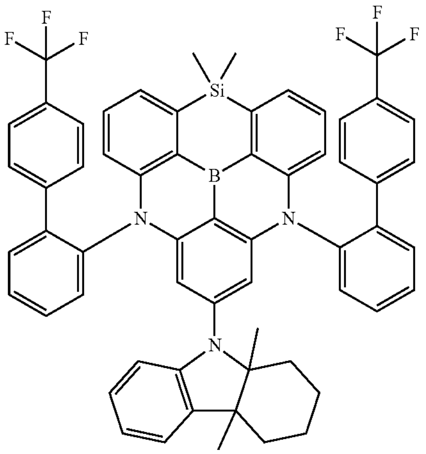
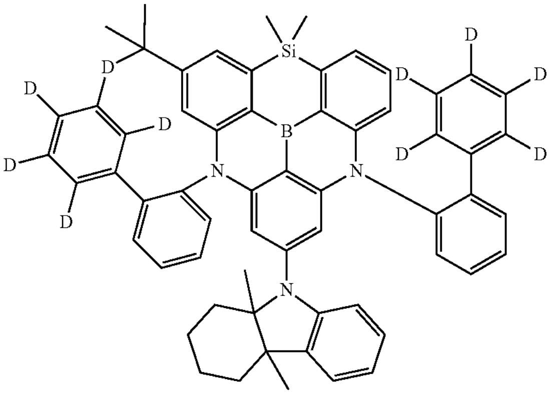
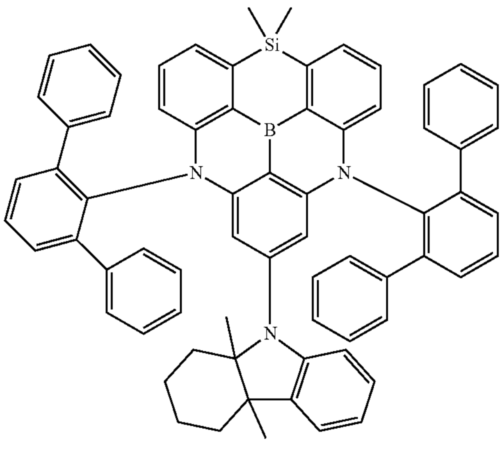

-continued
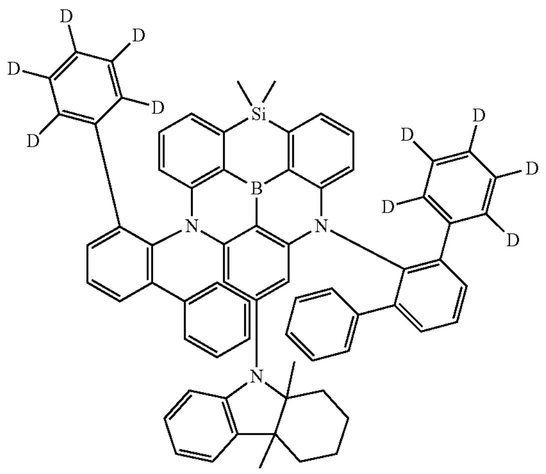
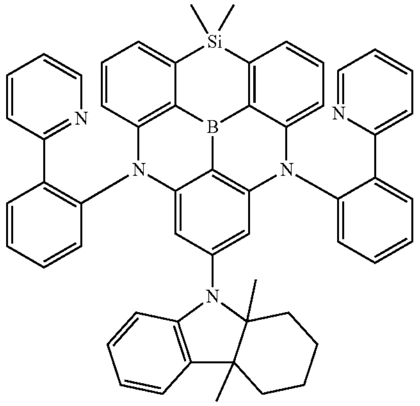
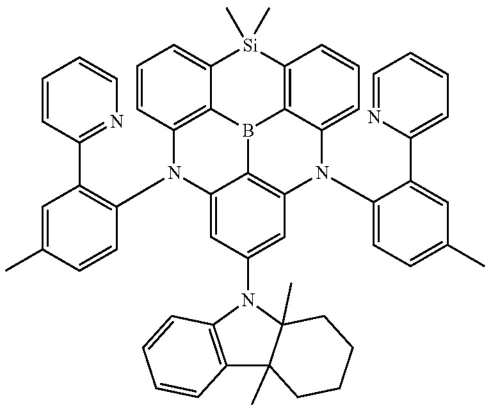
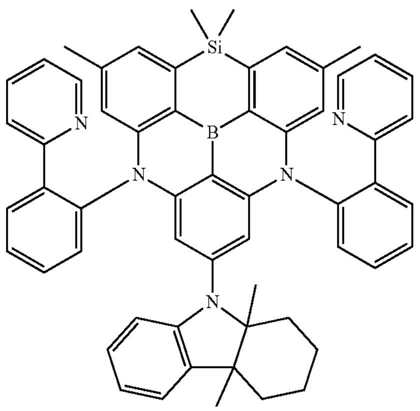
-continued
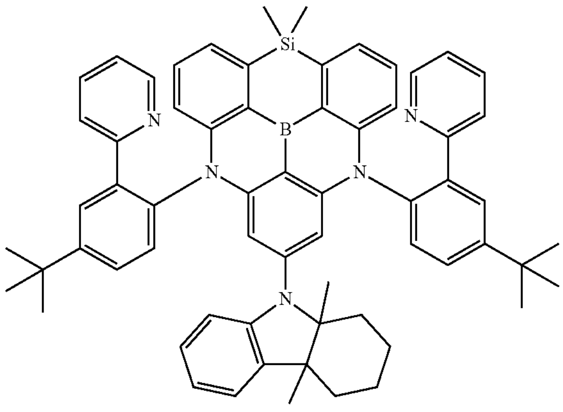
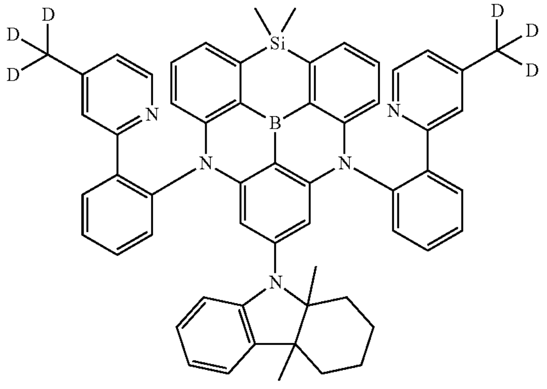
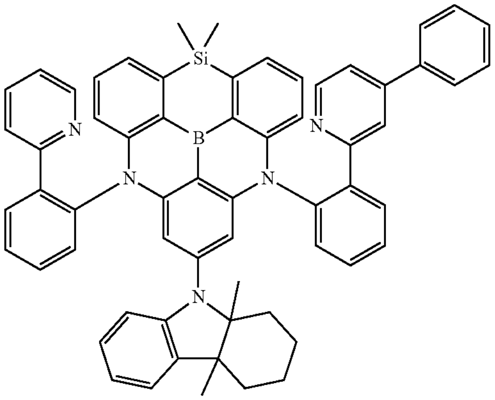
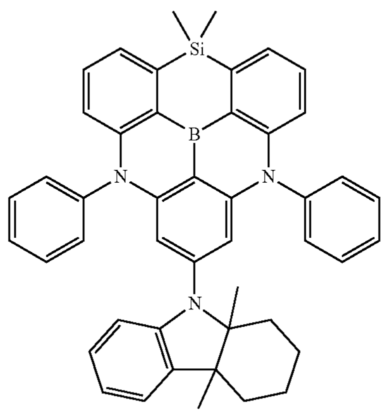

-continued
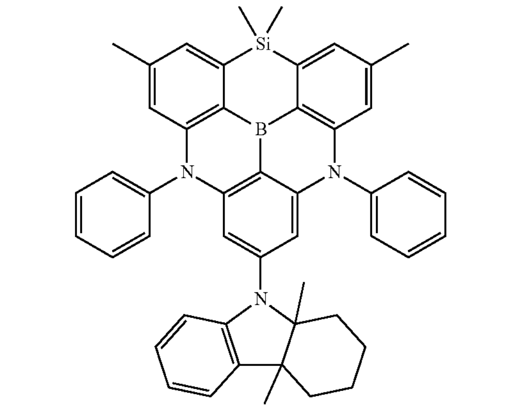
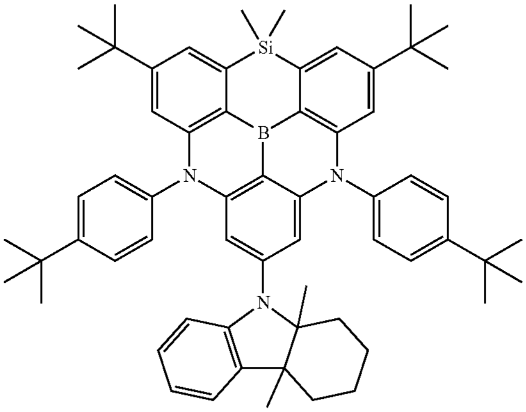
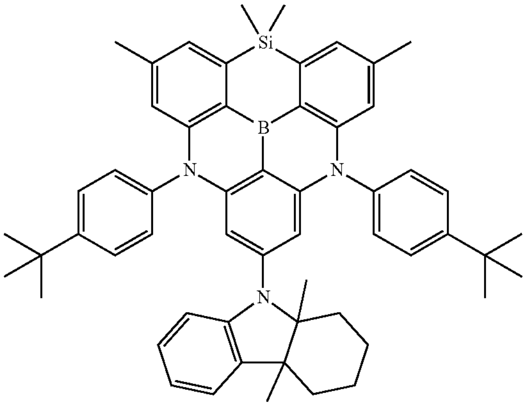
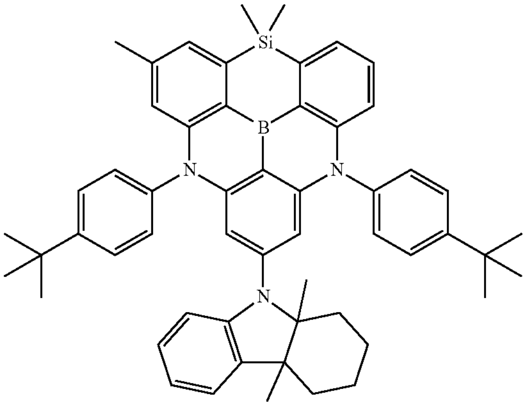 [SMILES: Cc1cc2c3c(c1)[Si](C)(C)c1cccc4c1B3c1c(cc(N3c5ccccc5C5(C)CCCCC35C)cc1N2c1ccc(C(C)(C)C)cc1)N4c1ccc(C(C)(C)C)cc1]
-continued
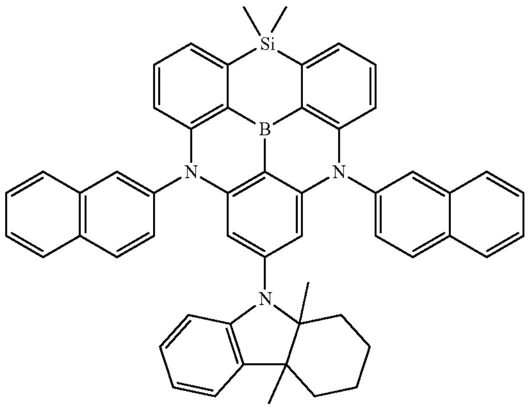
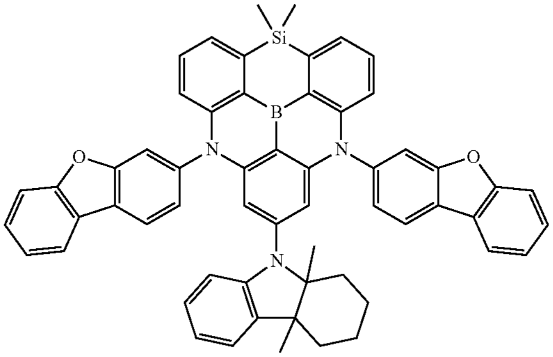
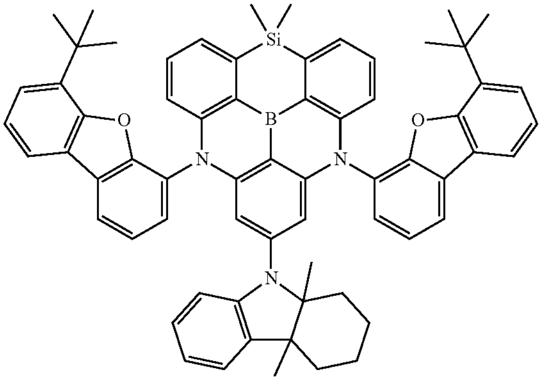
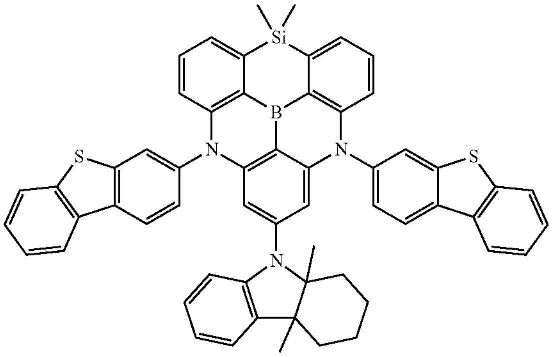

-continued
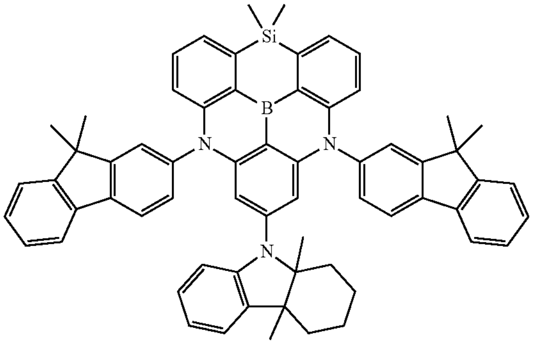
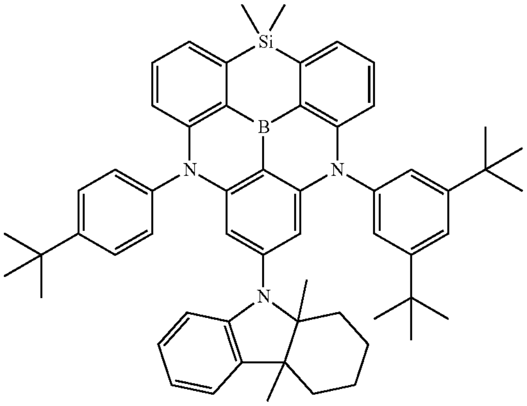
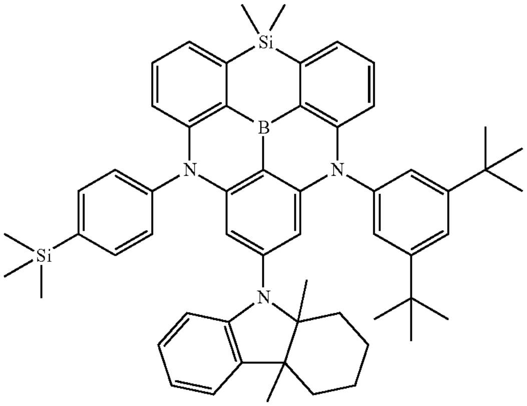
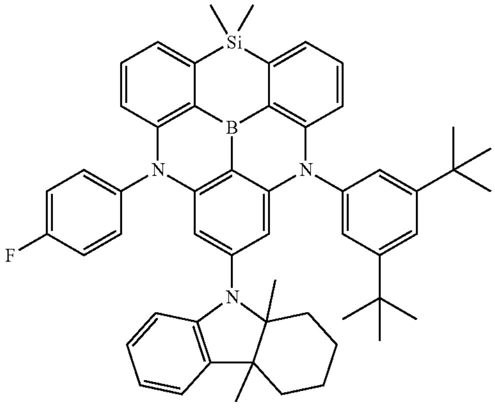
-continued
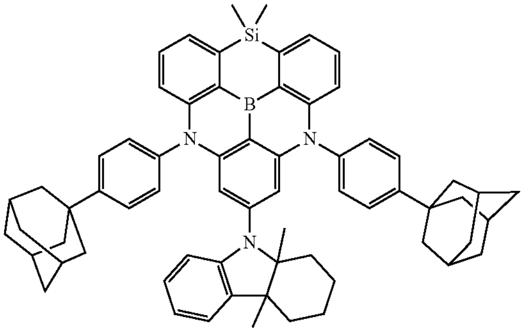
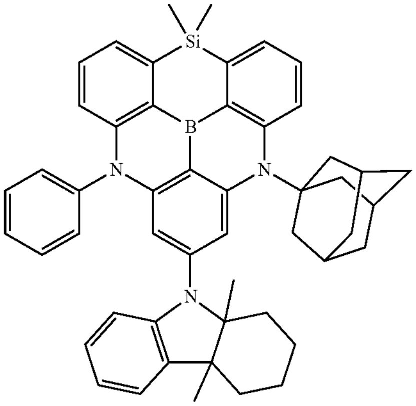
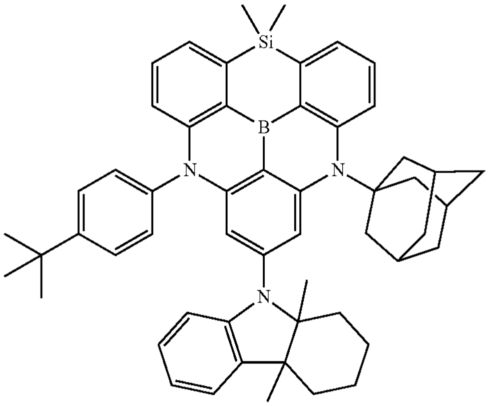
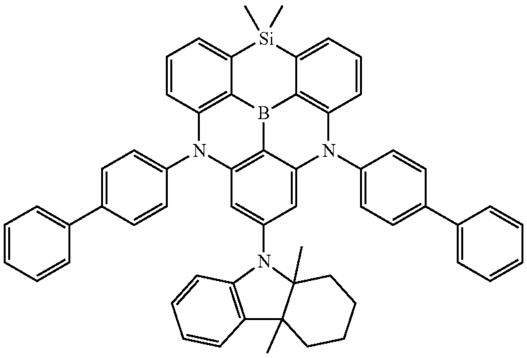

-continued
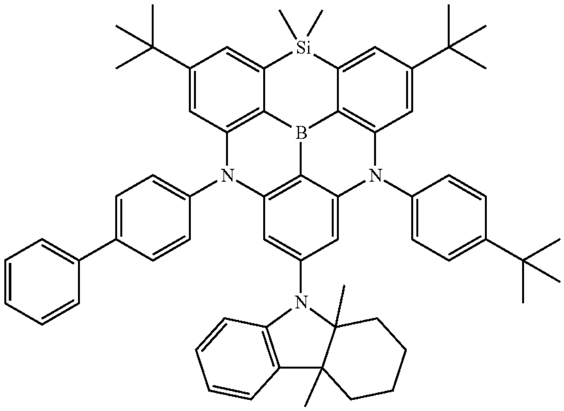
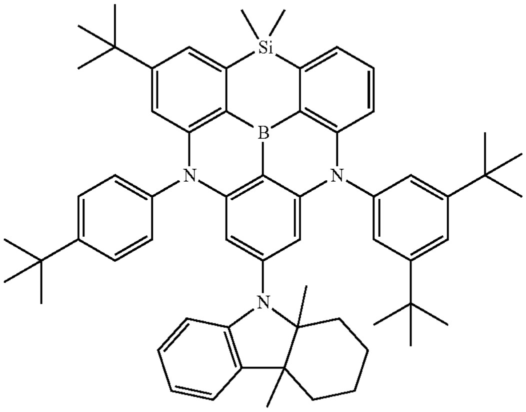
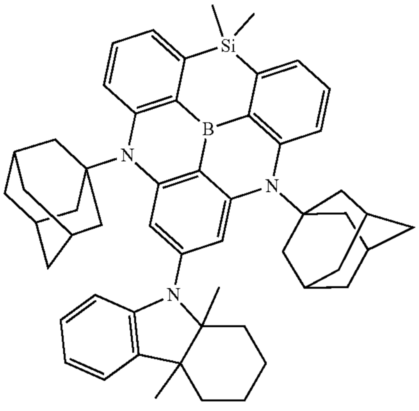
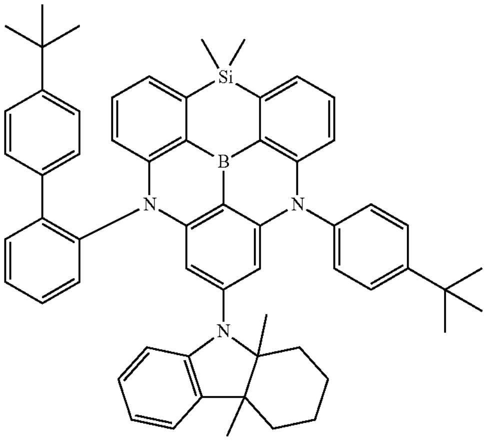
-continued
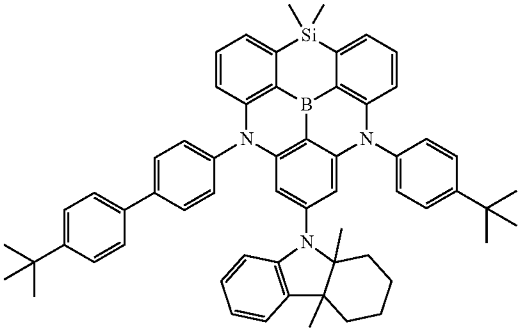
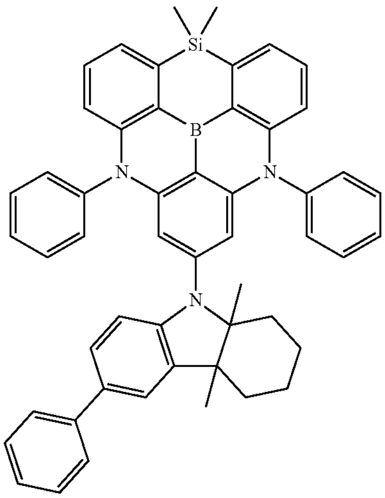
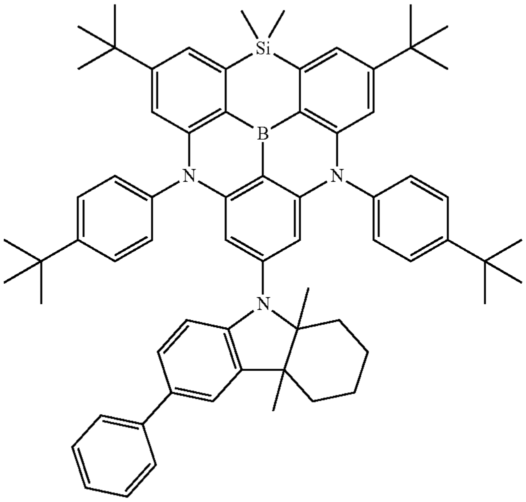

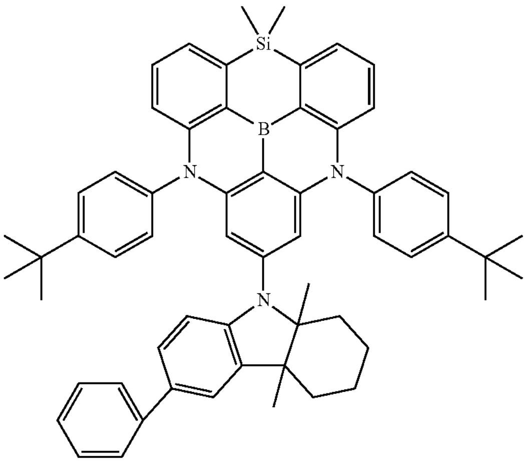
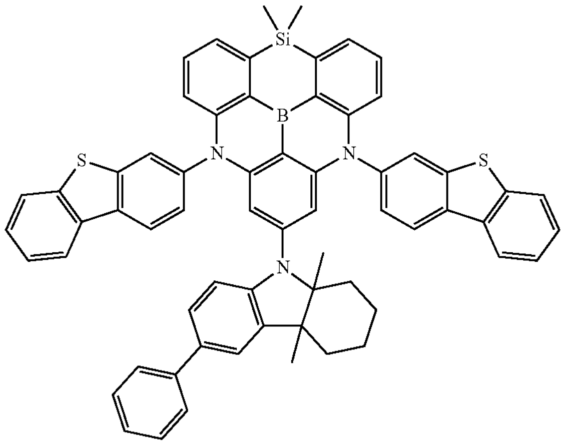
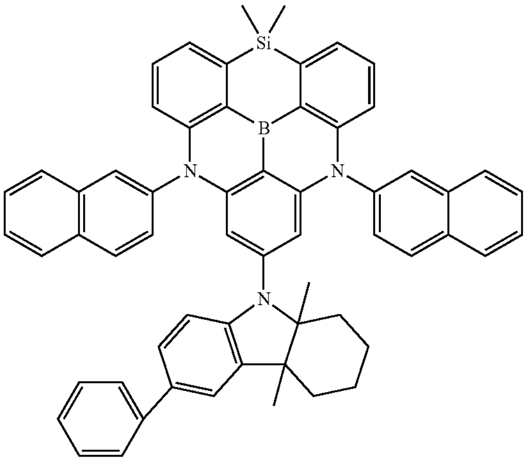
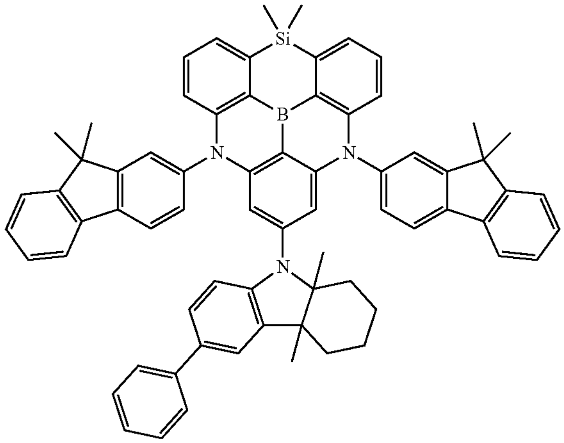
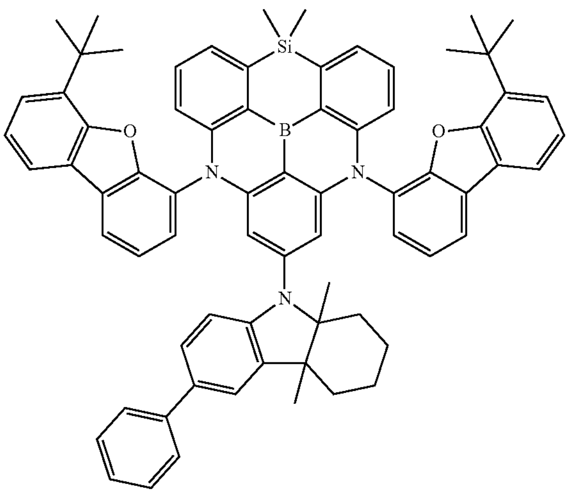
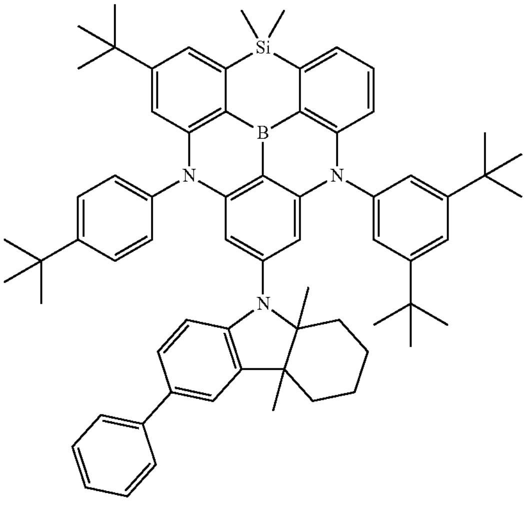

-continued
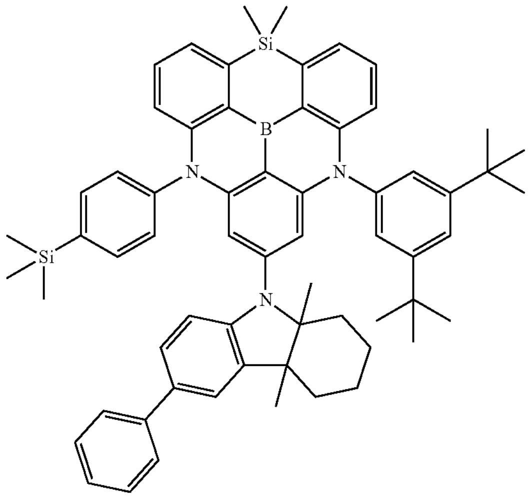
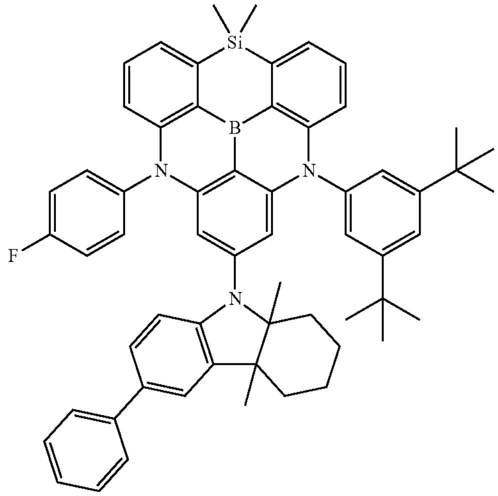
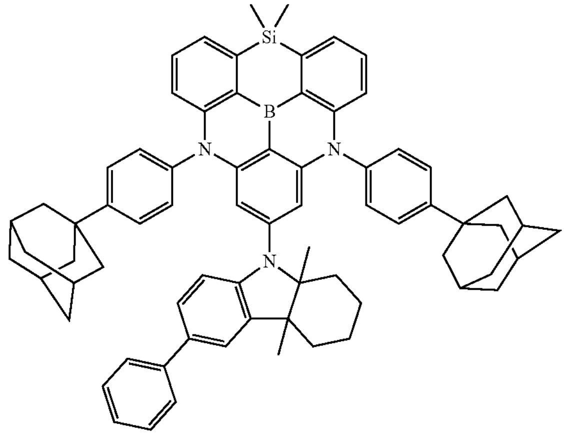
-continued
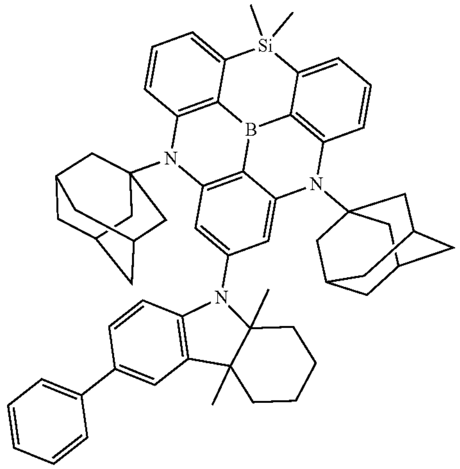
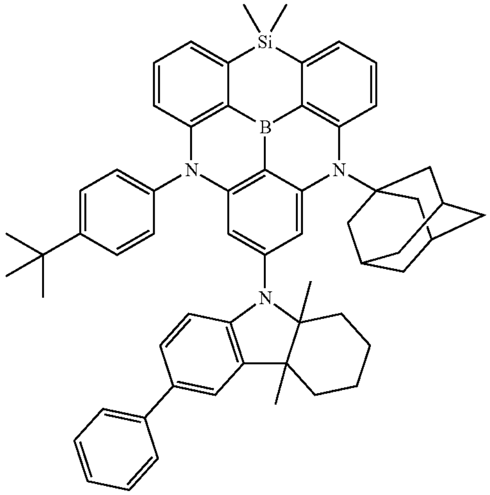
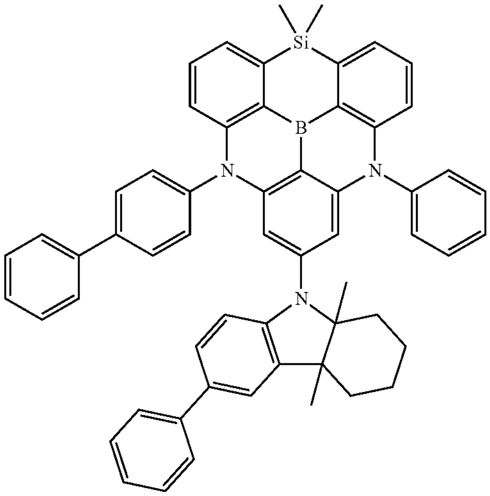

-continued
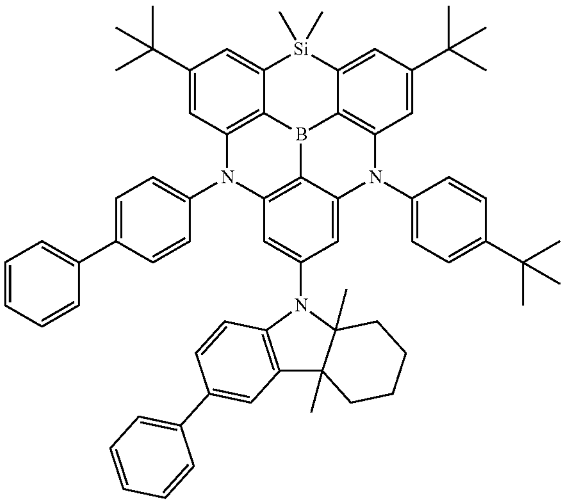
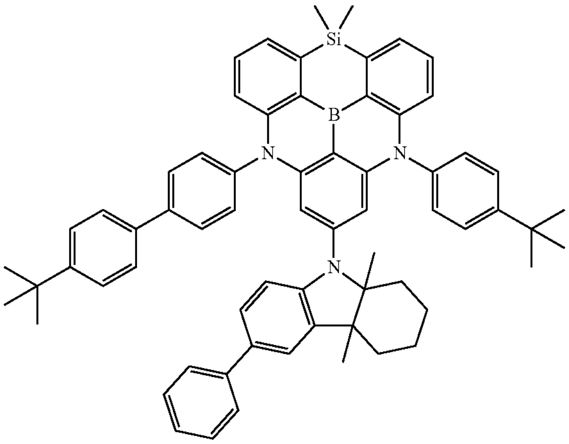
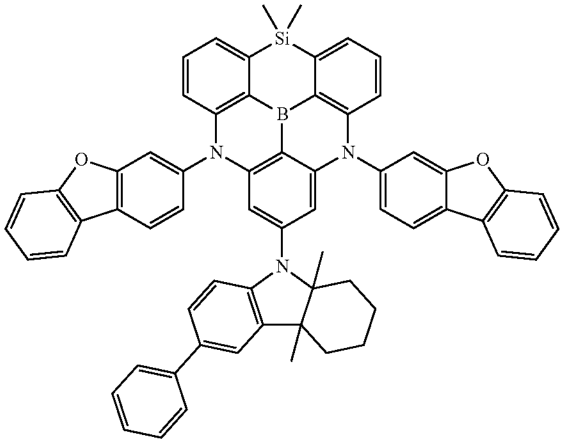
-continued
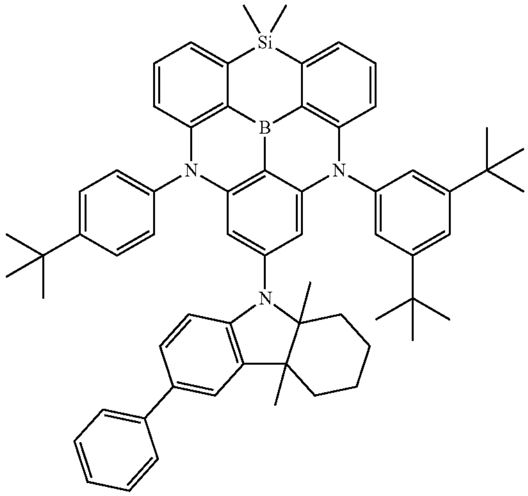
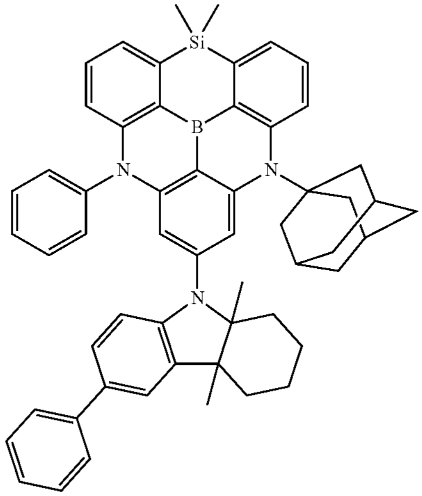
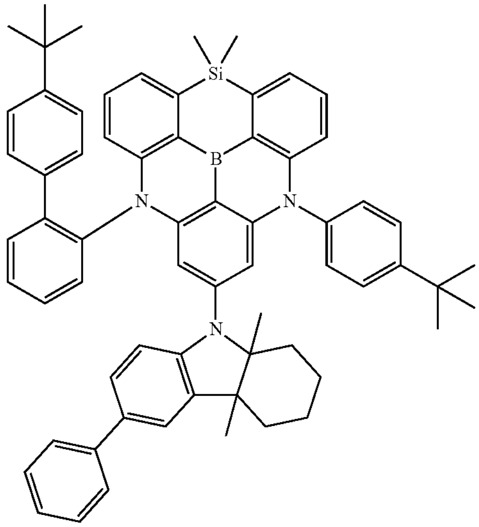

-continued
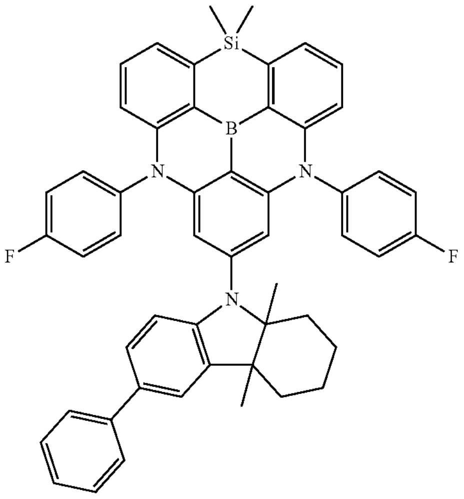
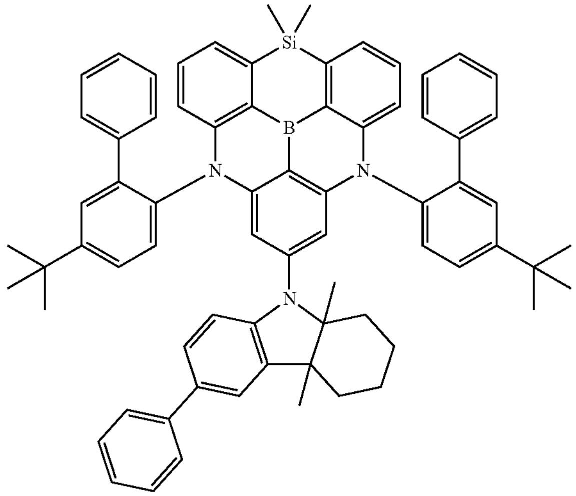
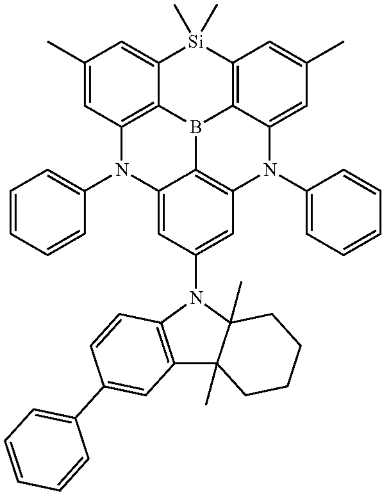
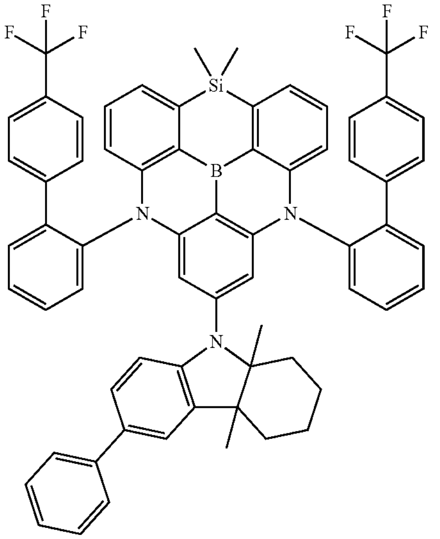
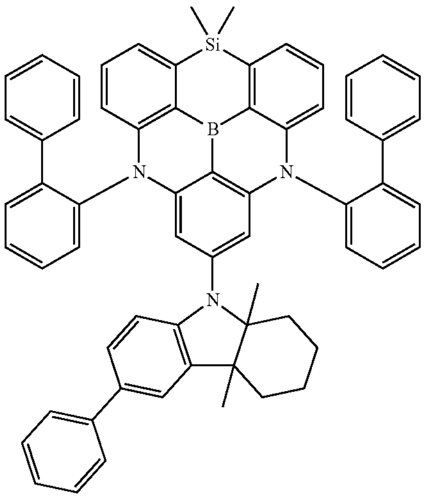
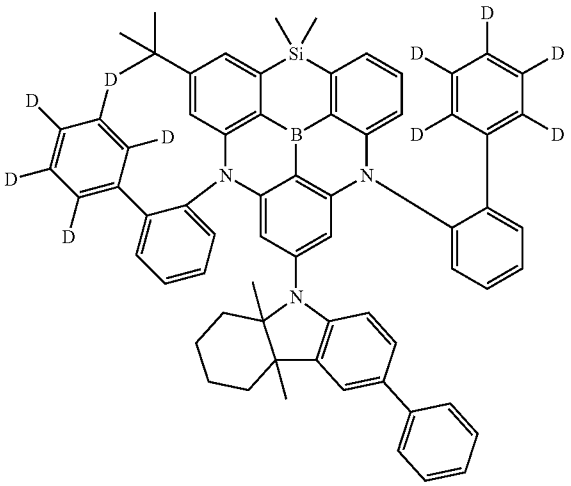

-continued
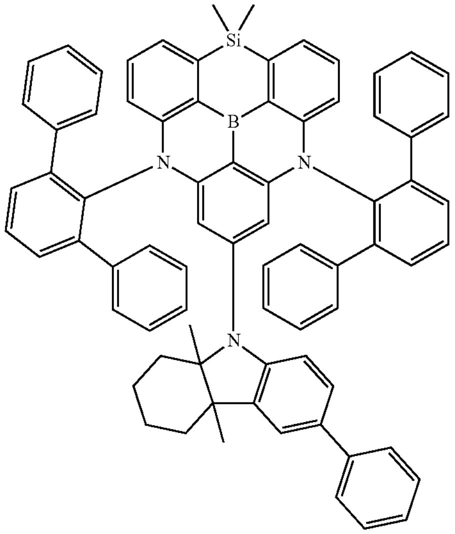
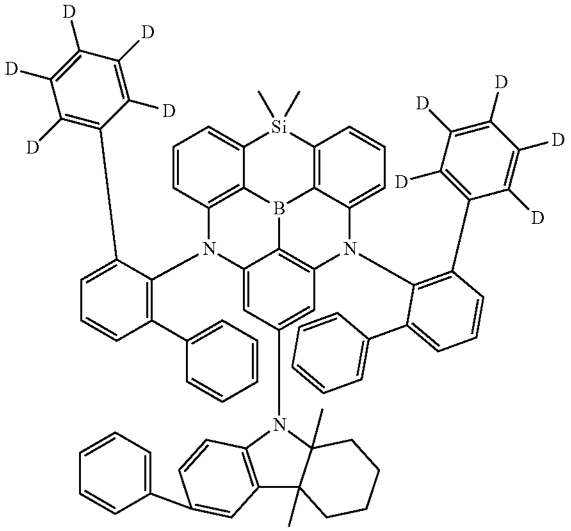
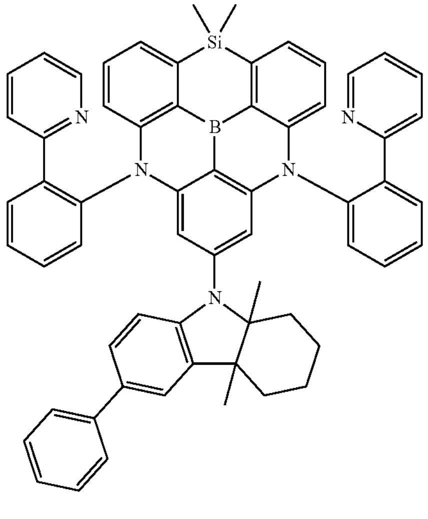
-continued
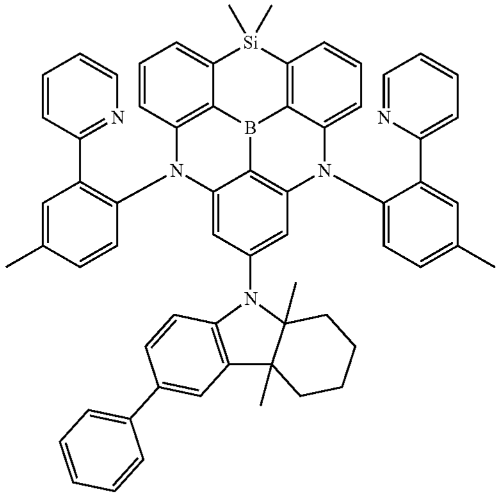
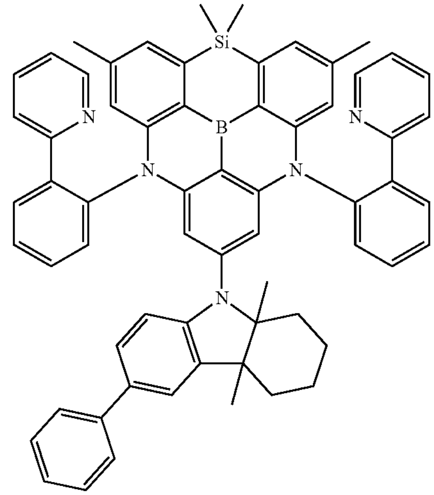
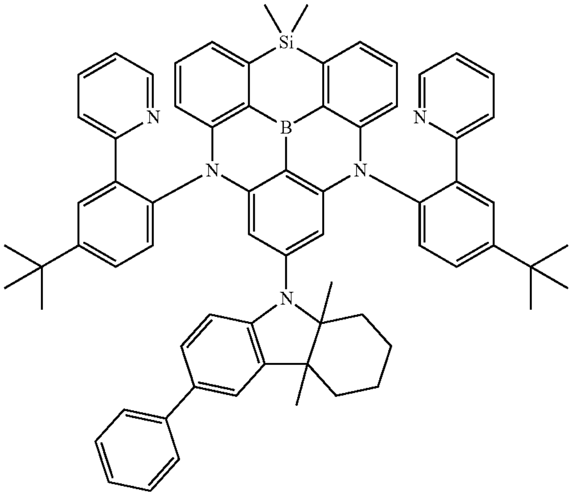

-continued
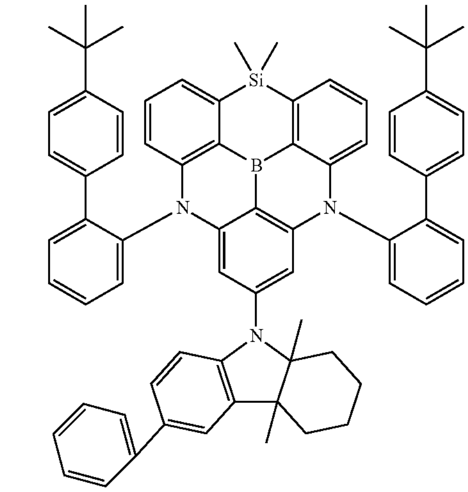
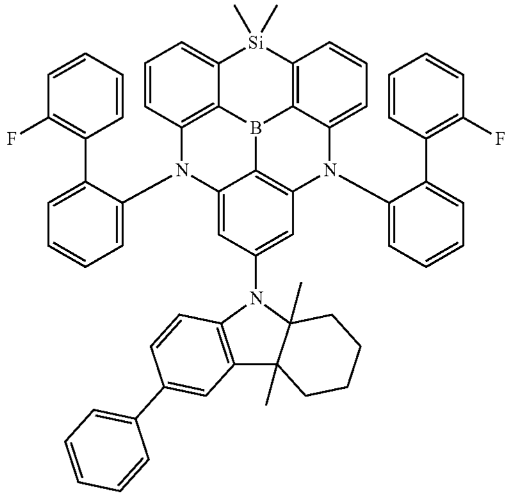
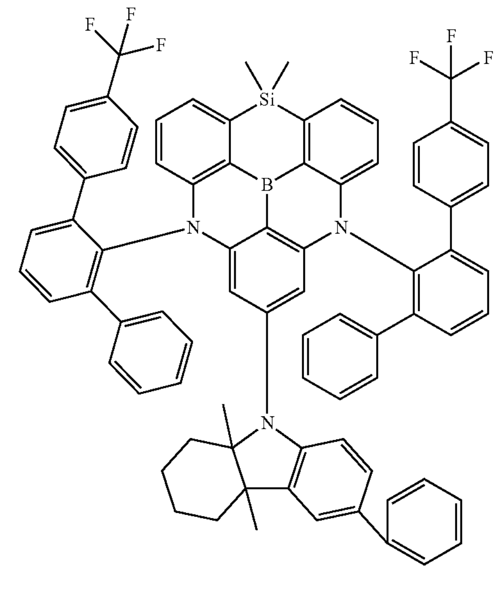
-continued
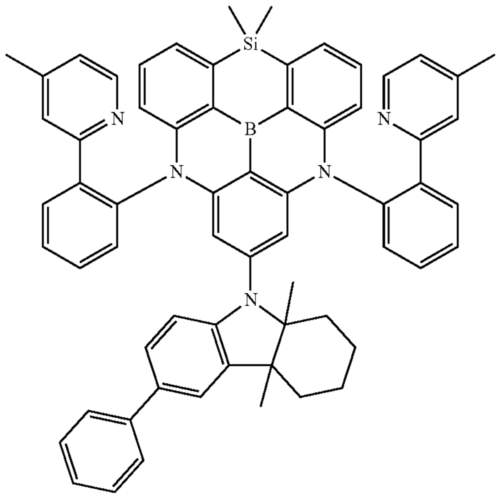
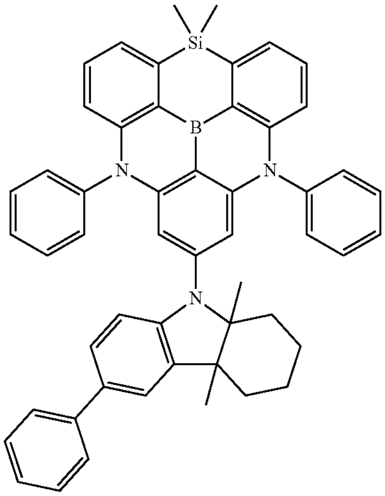
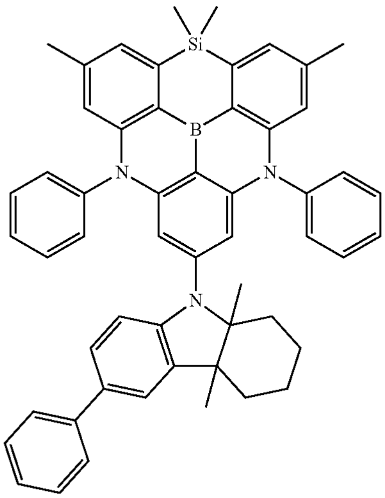

-continued
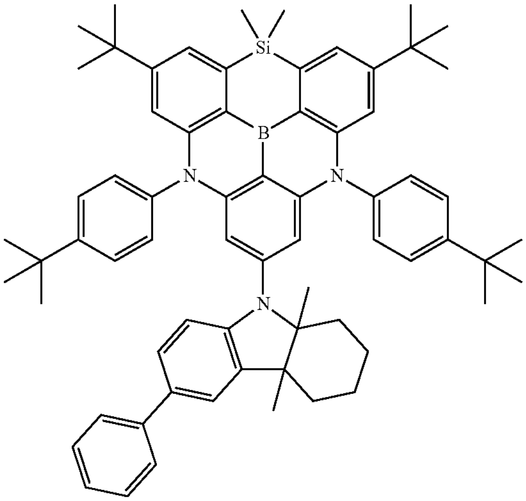
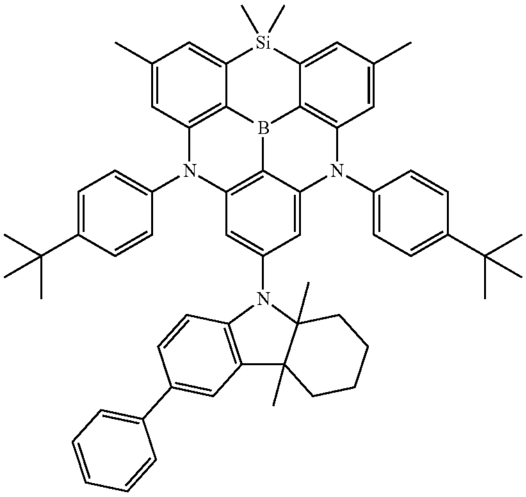
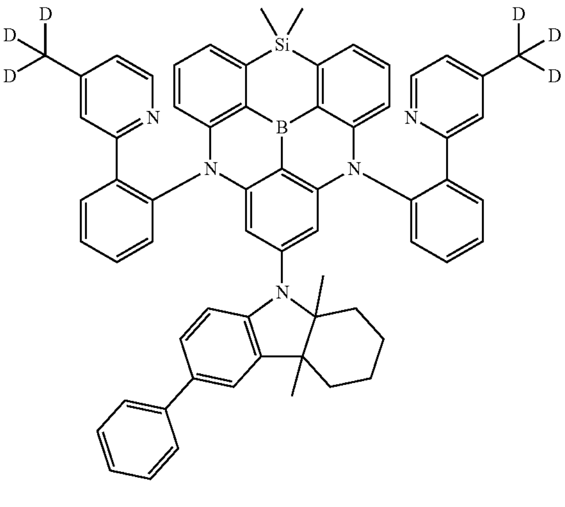
-continued
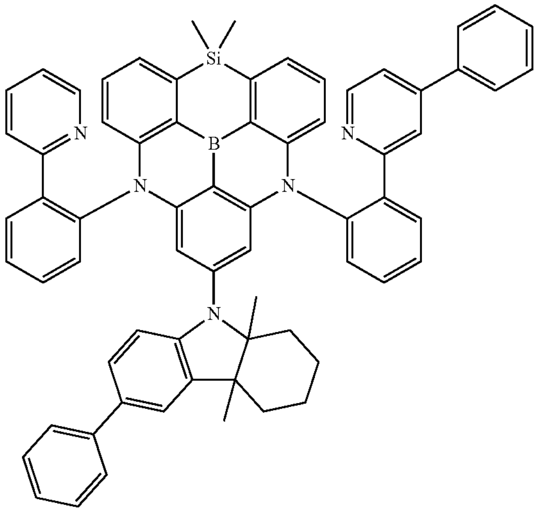
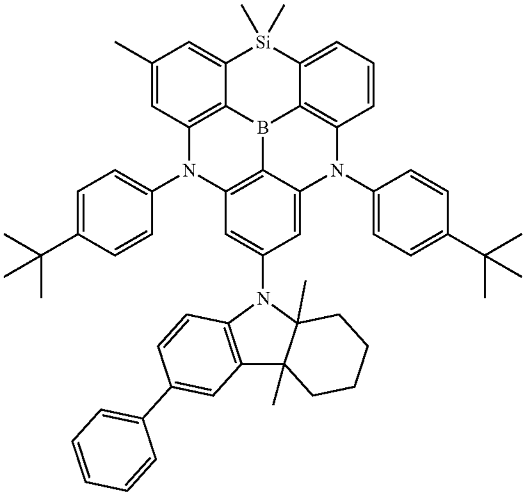
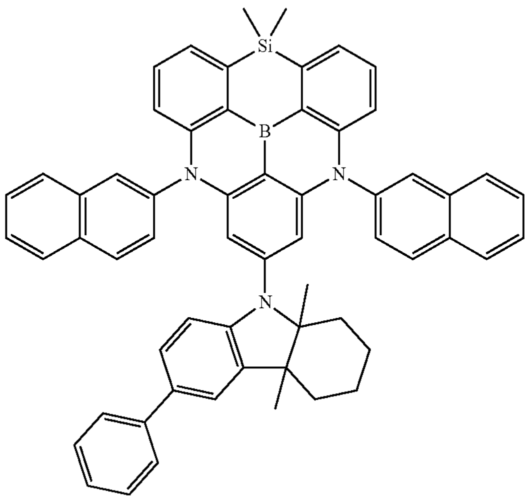

-continued
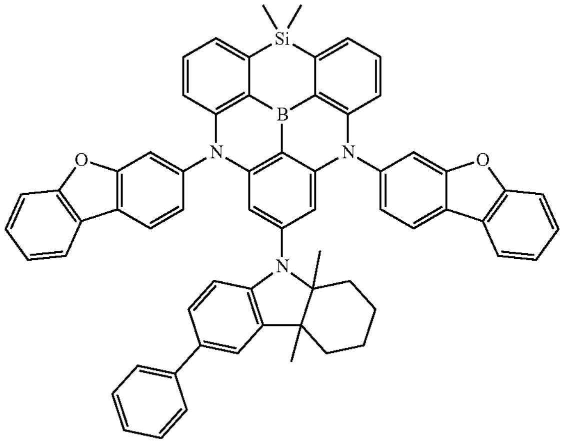
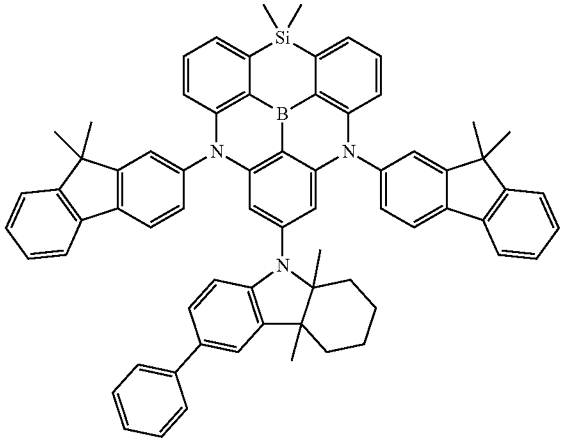
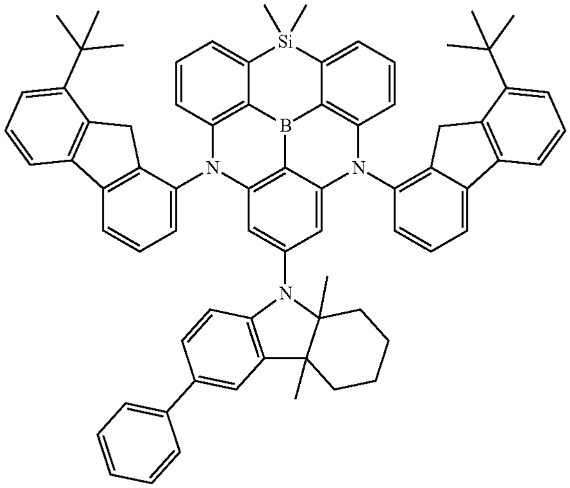
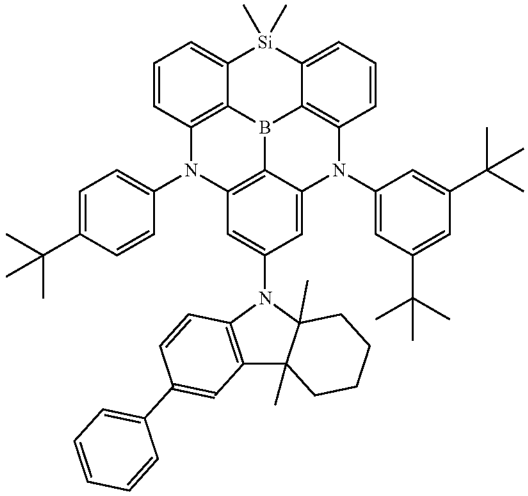
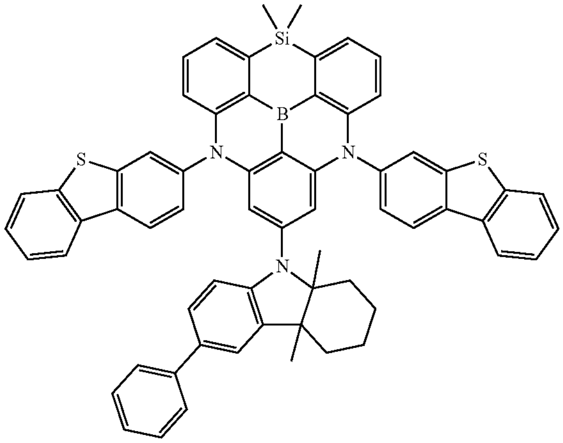
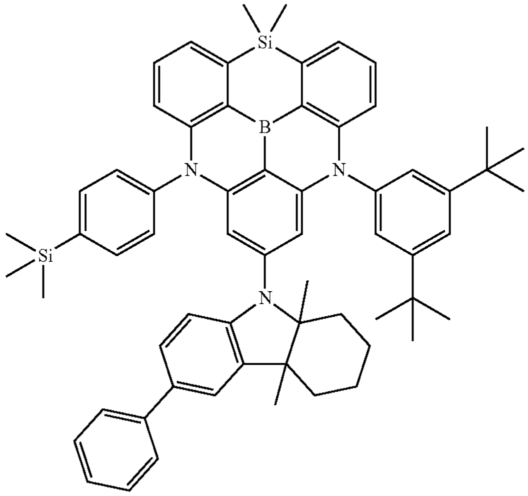

-continued
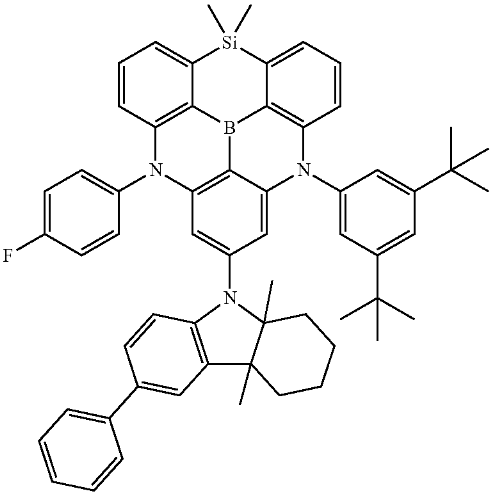
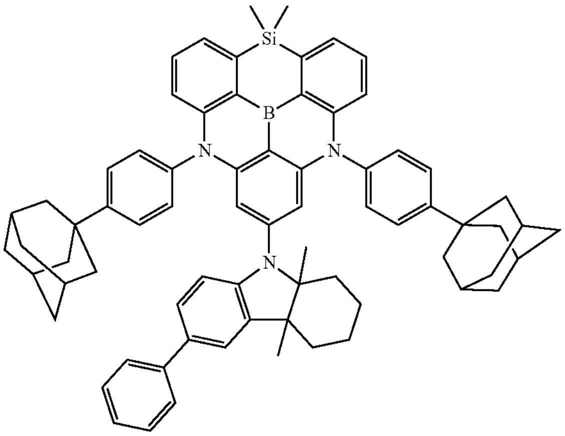
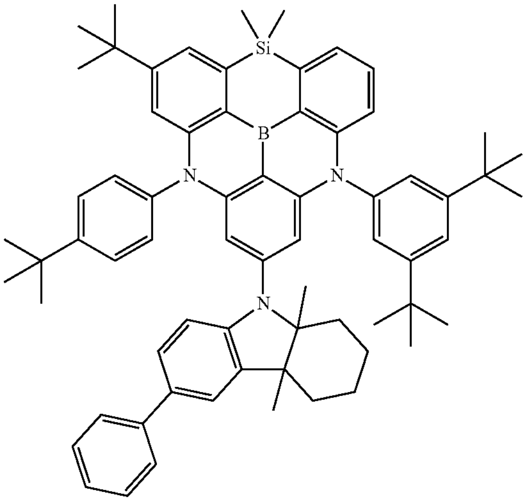
-continued
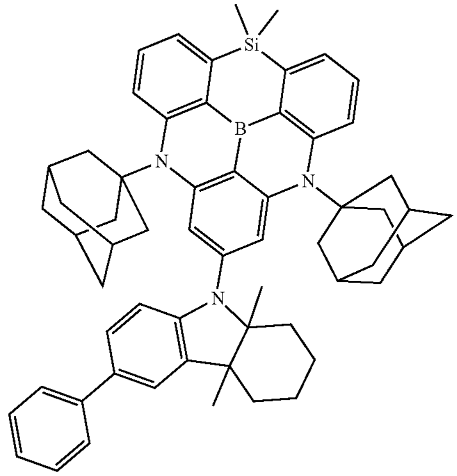
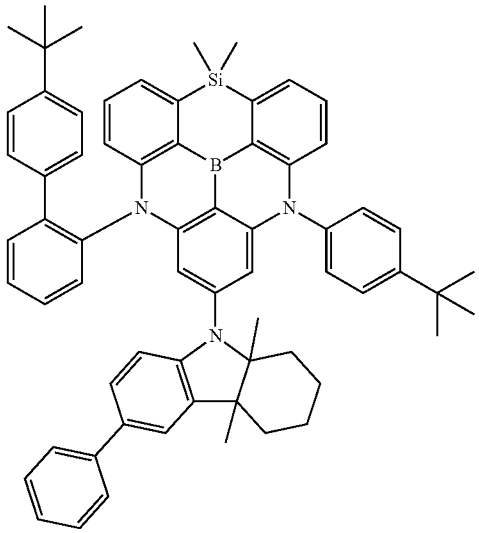
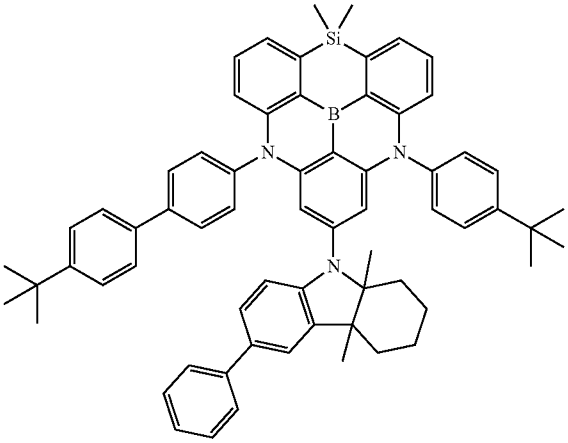

-continued
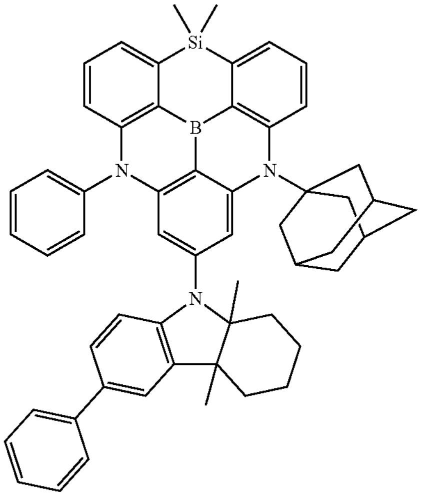
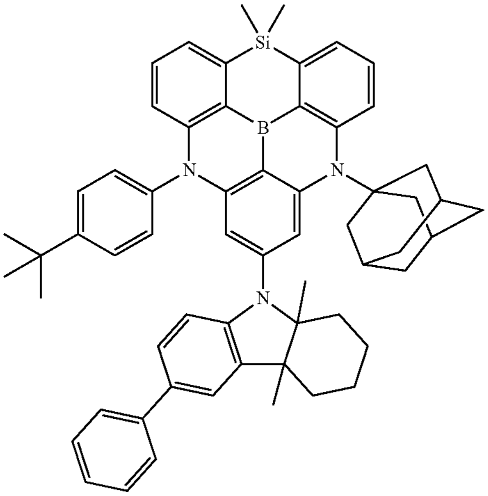
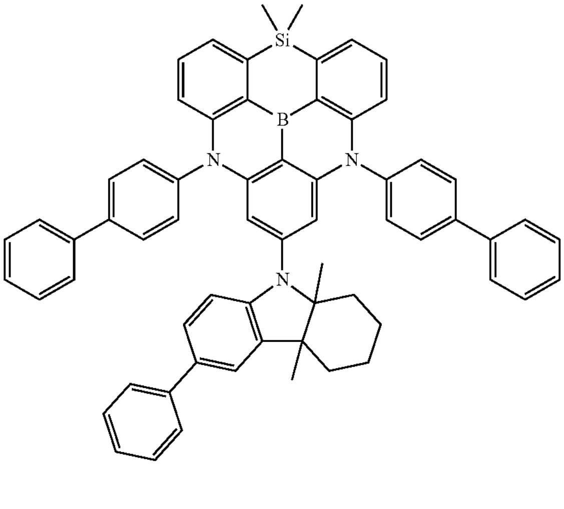
-continued
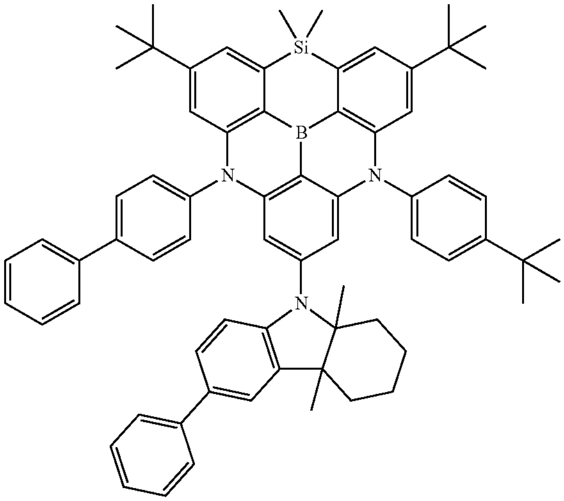
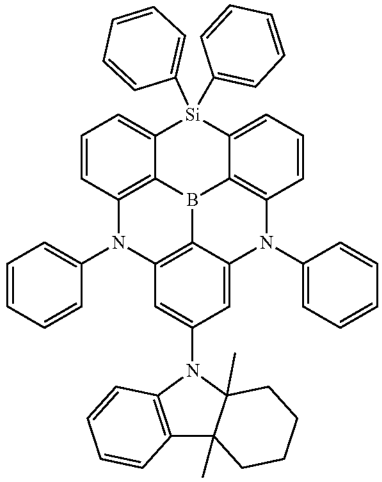
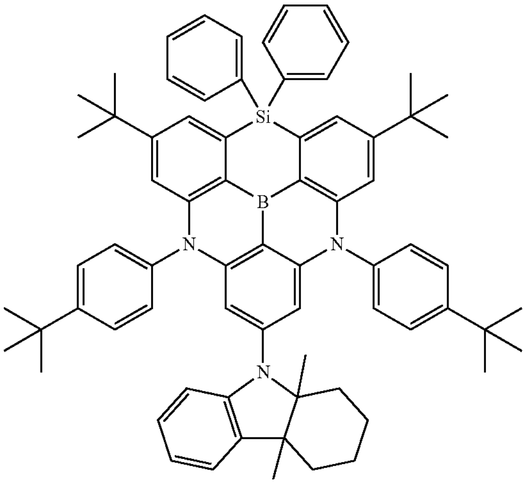

-continued
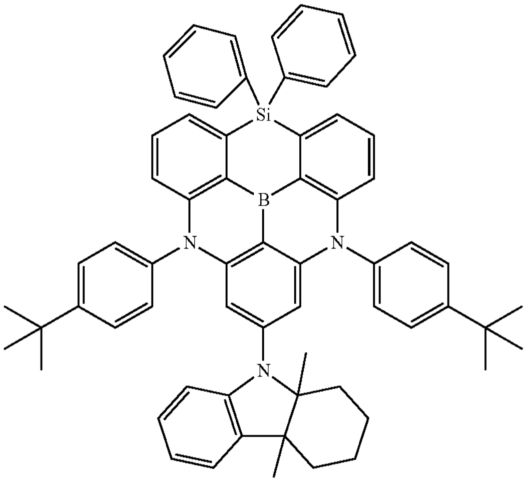
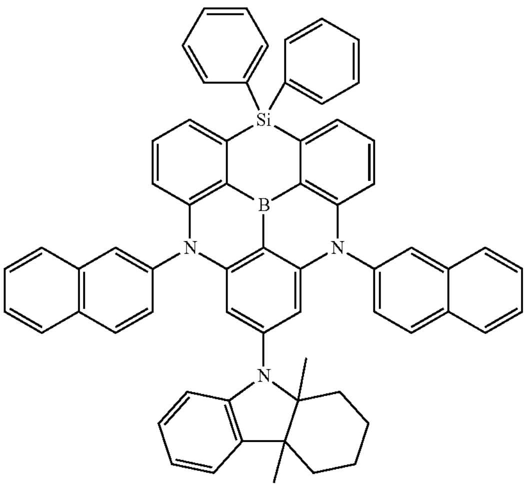
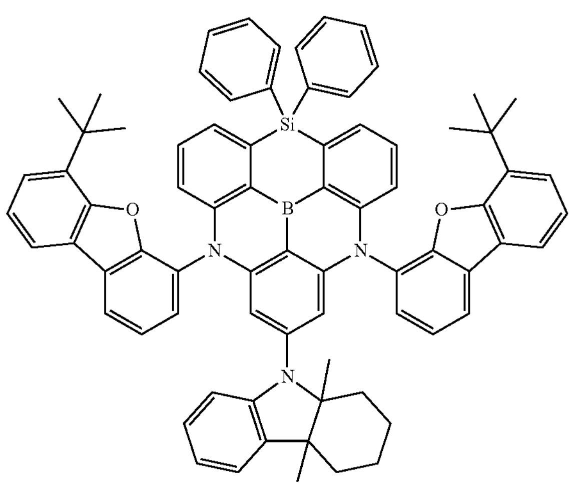
-continued
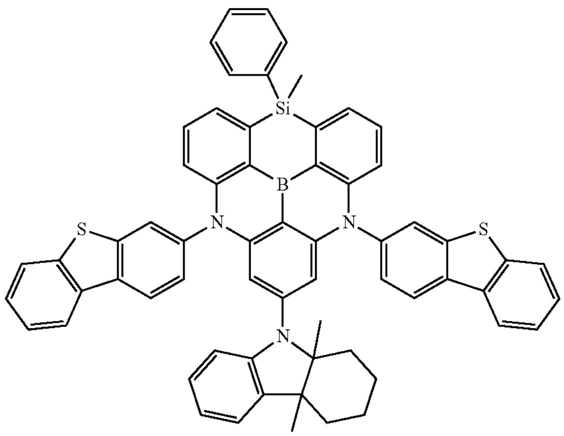
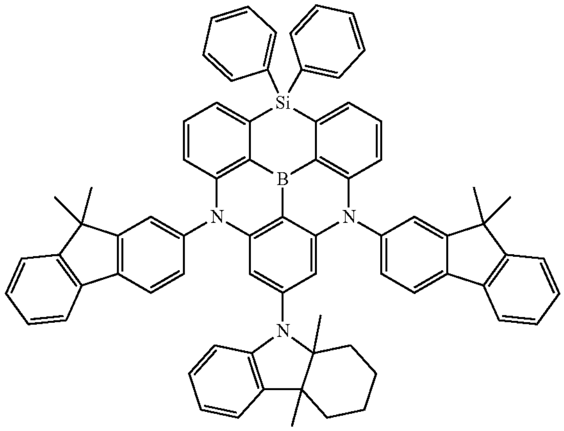
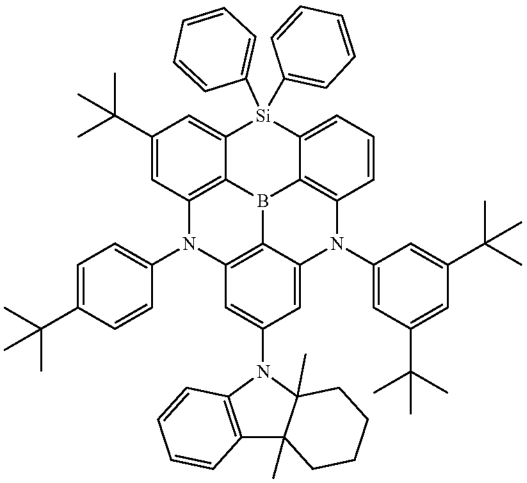

-continued
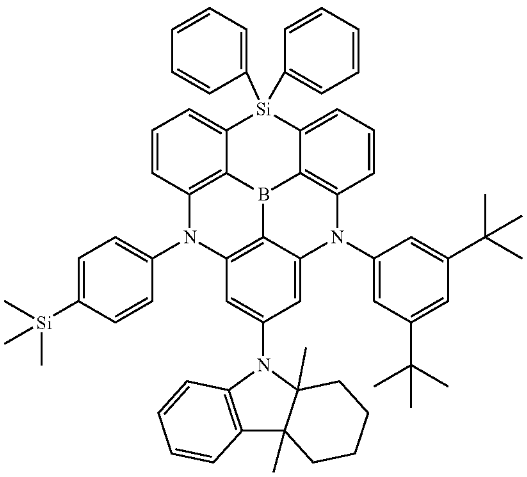
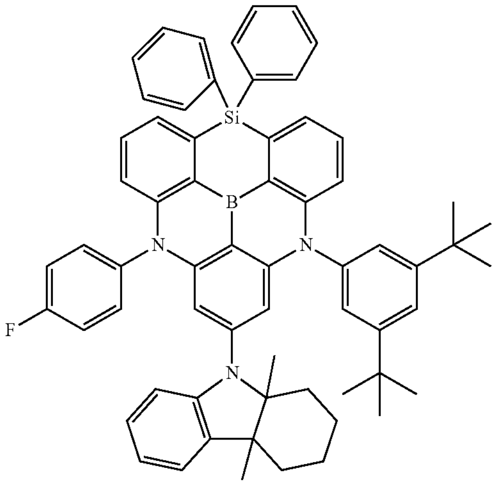
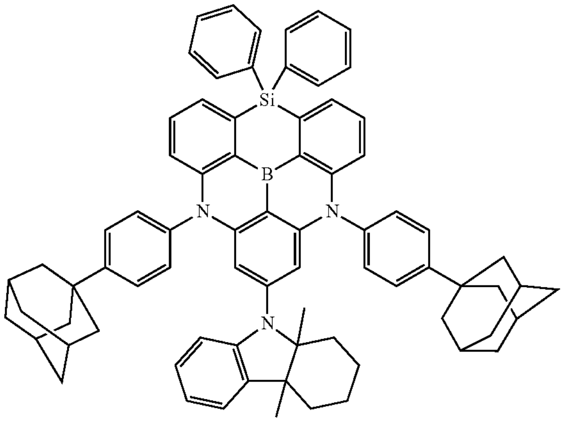
-continued
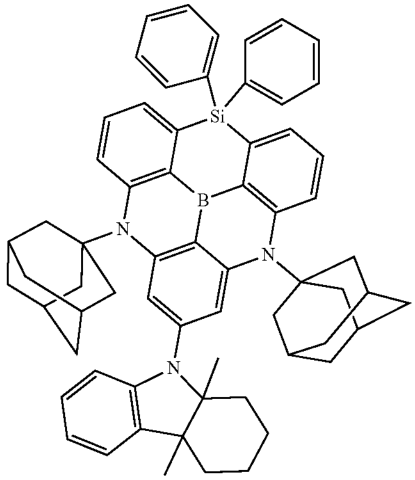
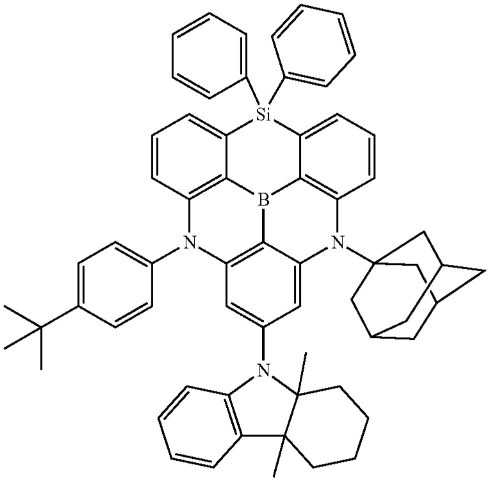
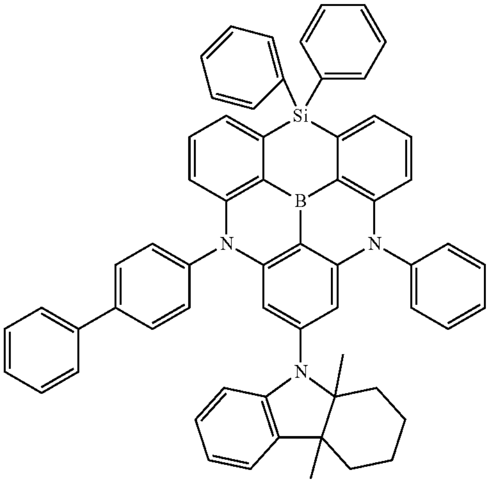

-continued
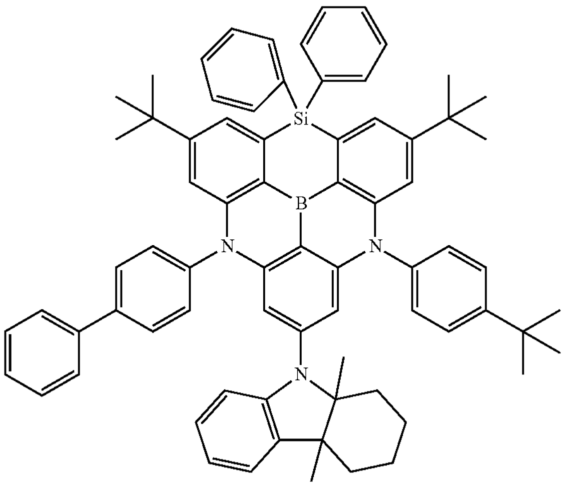
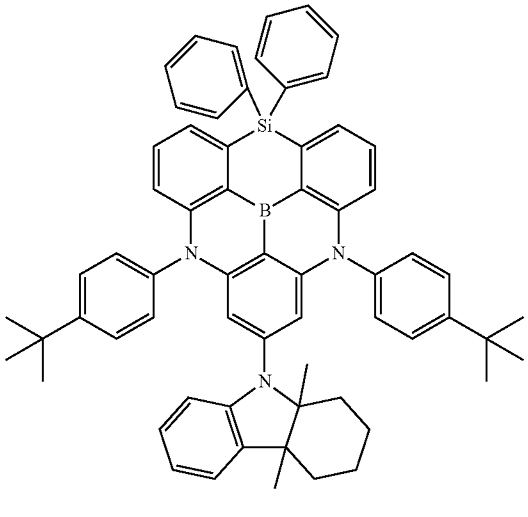
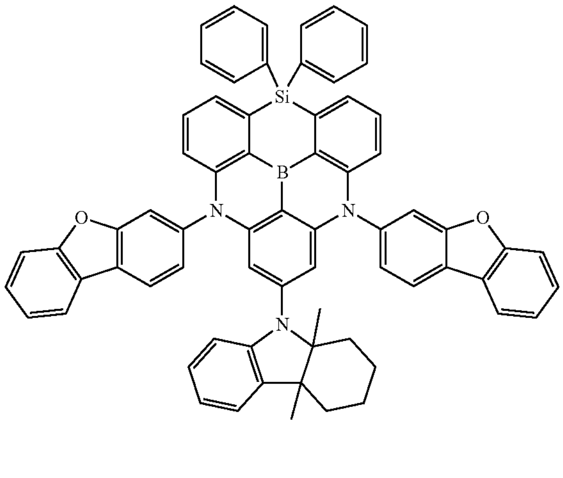
-continued
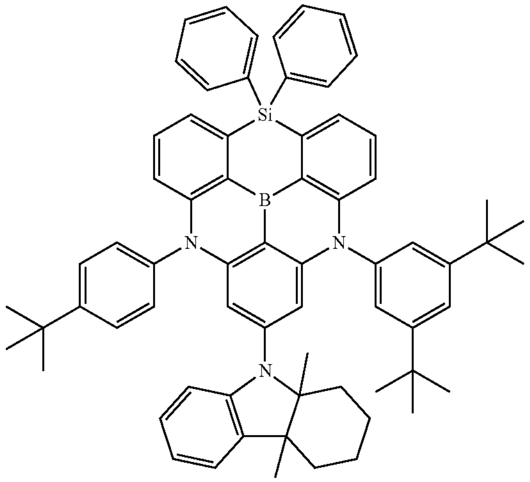
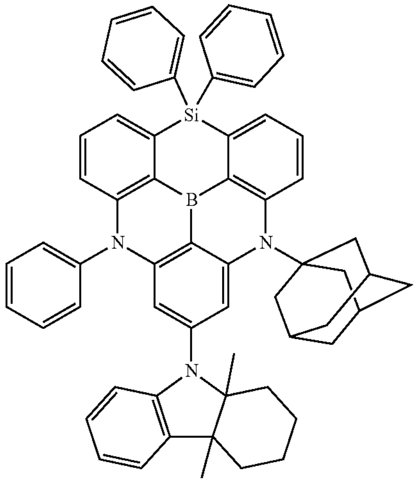
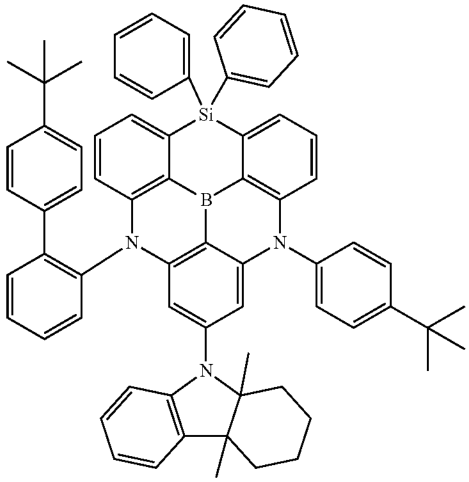

-continued
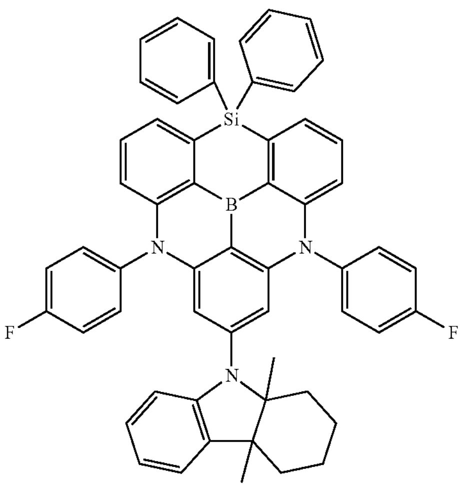
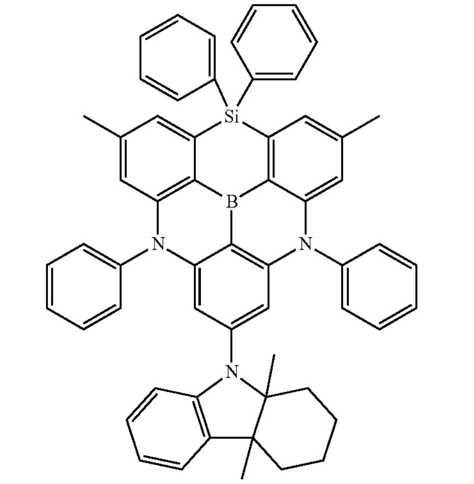
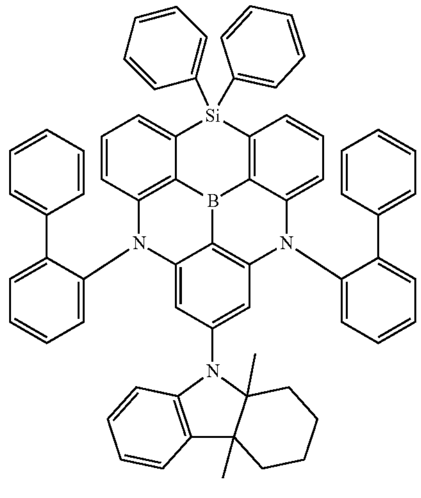
-continued
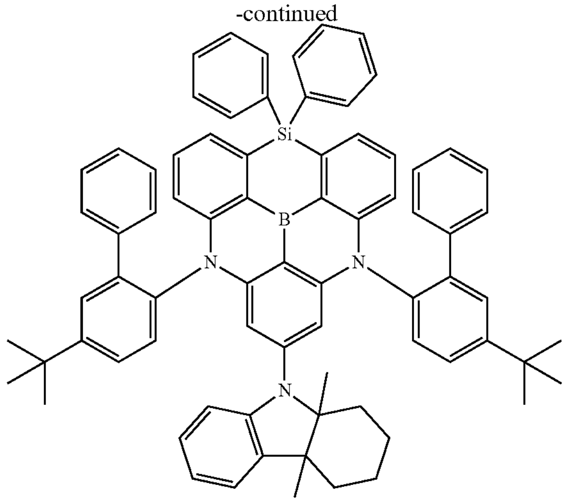
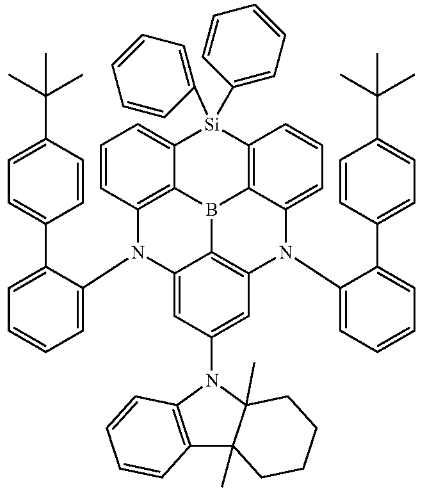
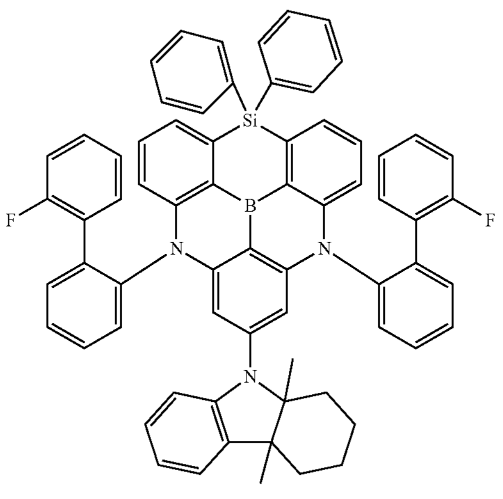

-continued
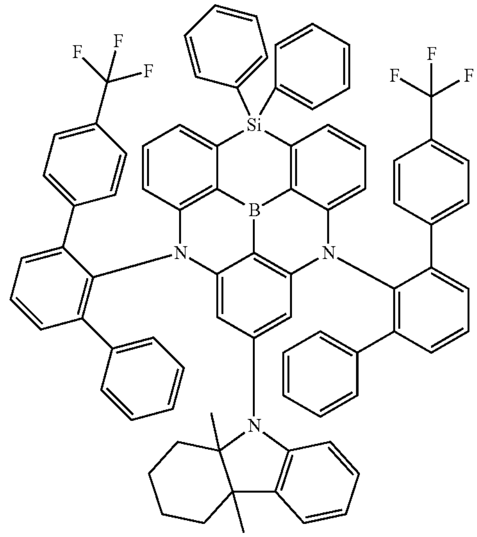
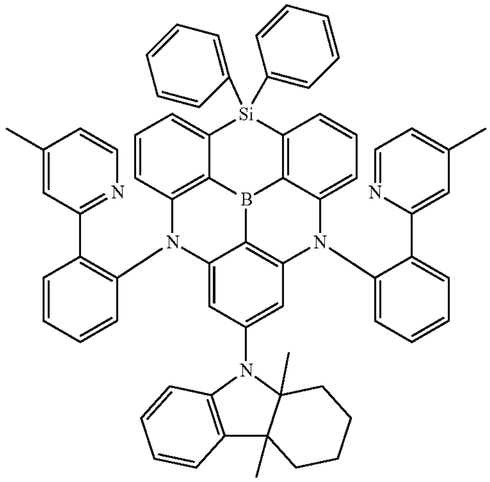
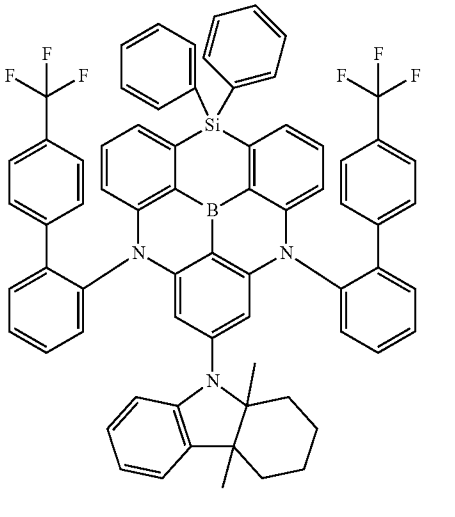
-continued
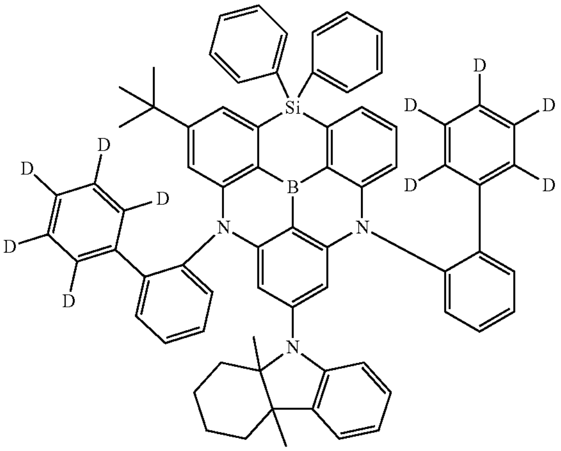
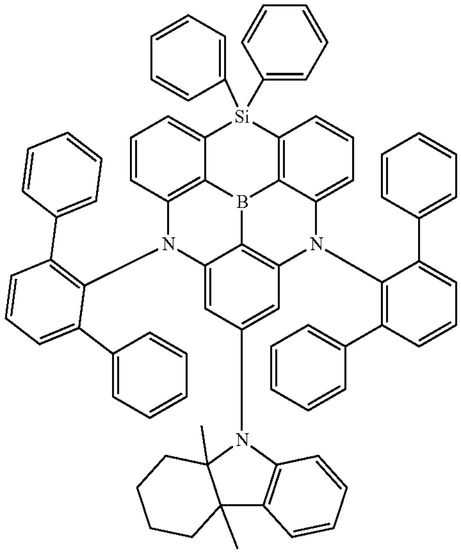
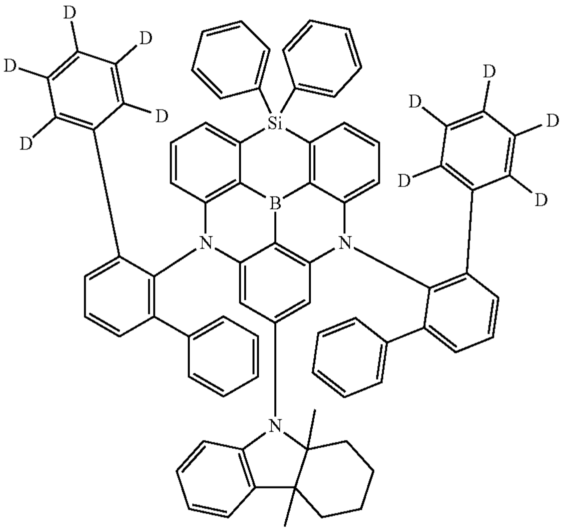

-continued
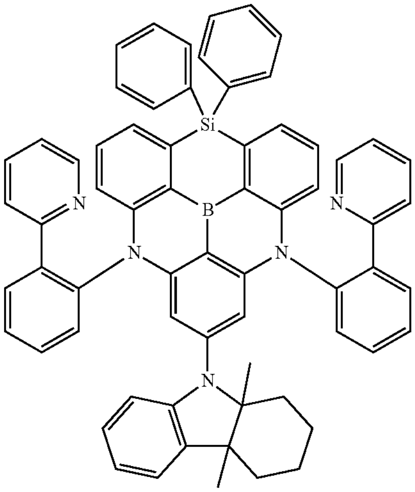
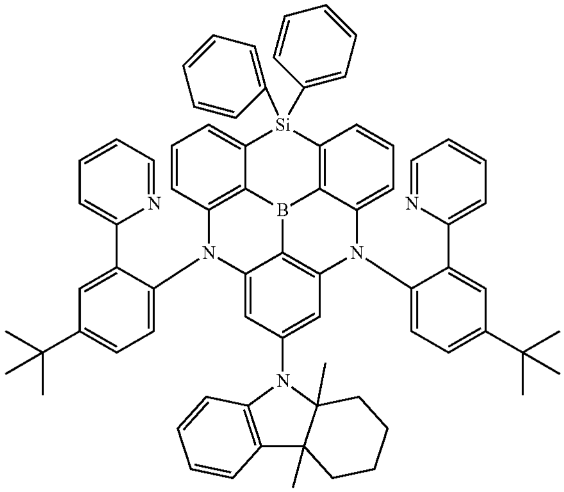
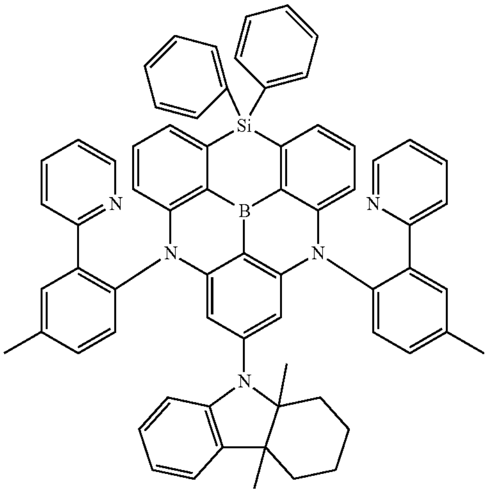
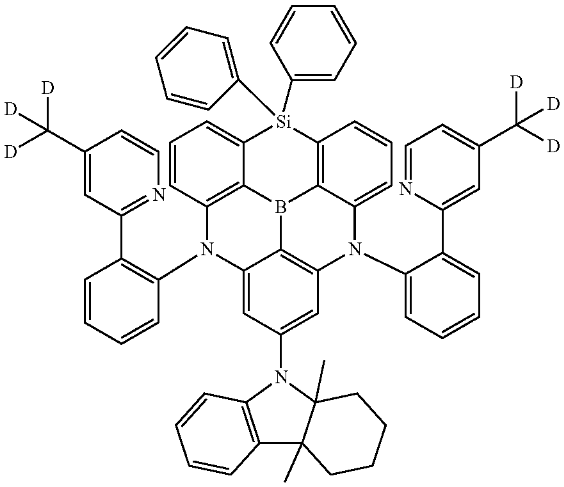
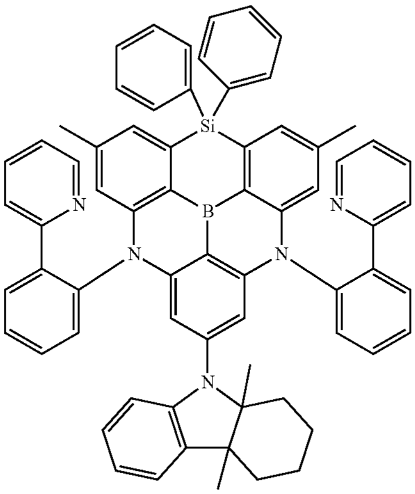
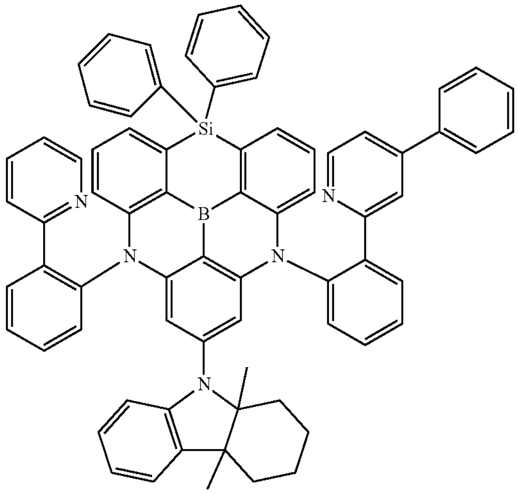
-continued -continued
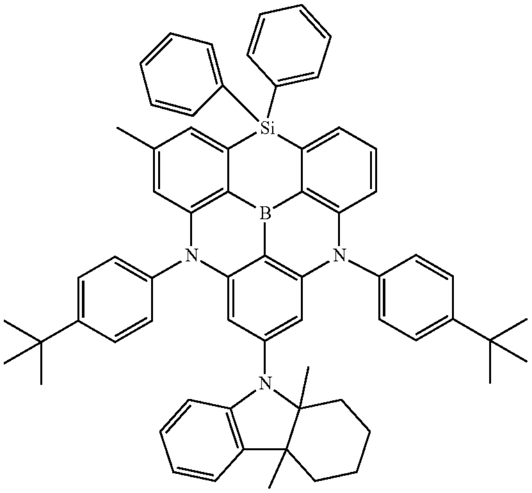
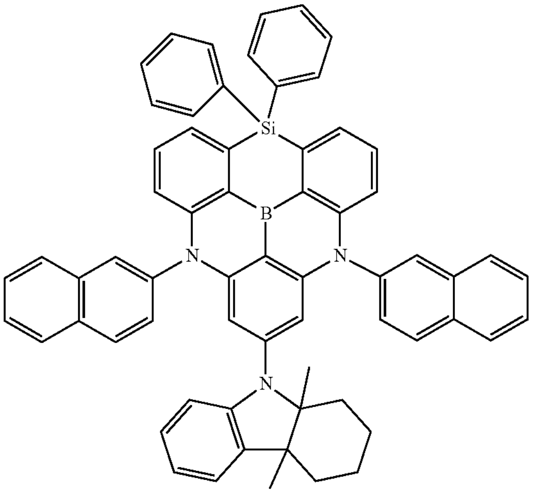
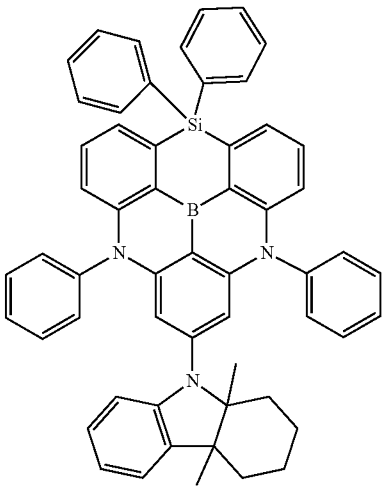
-continued
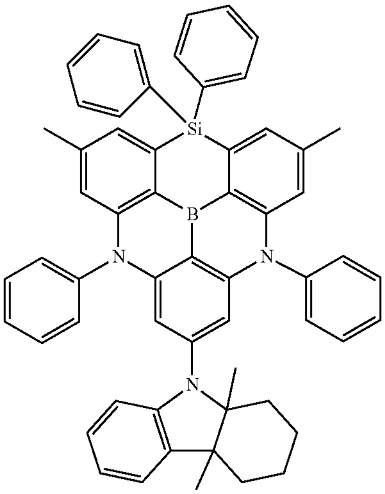
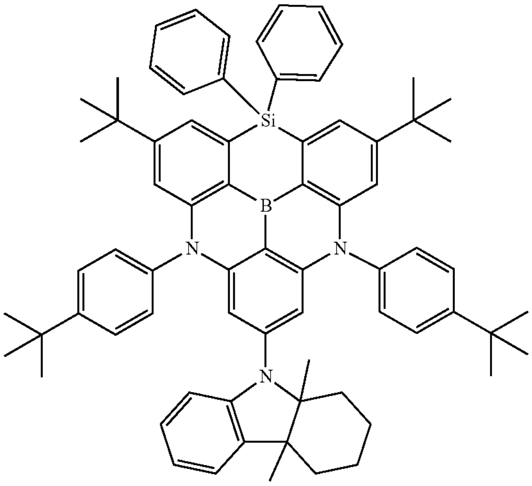
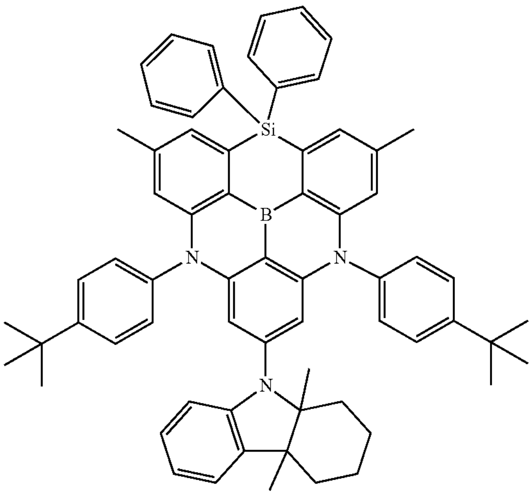

-continued
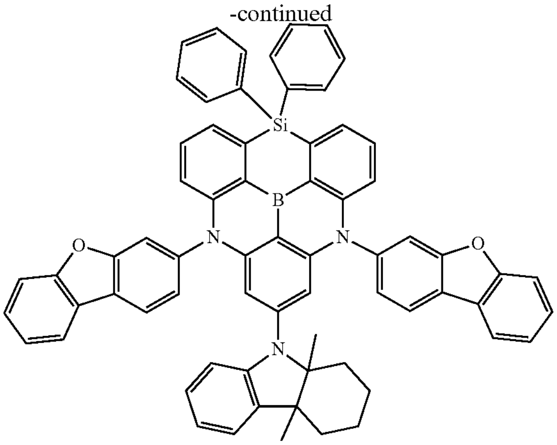
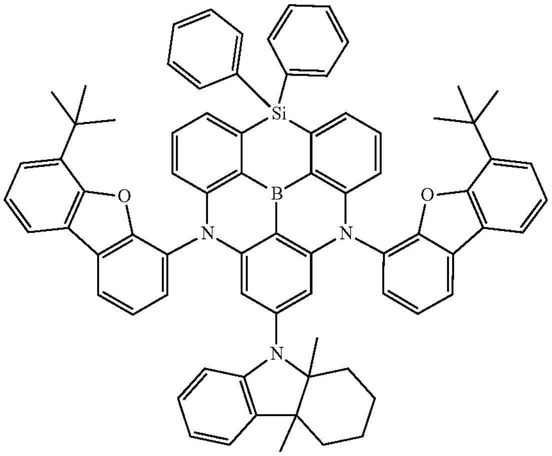
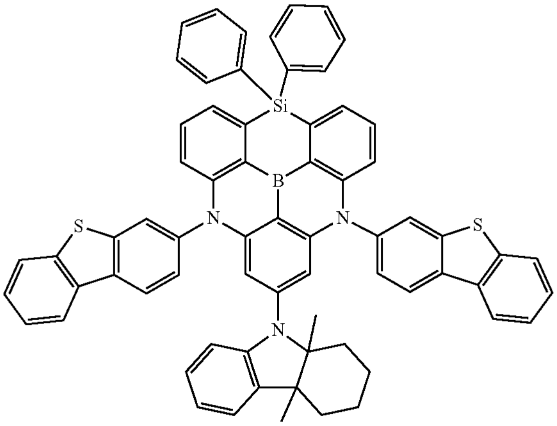
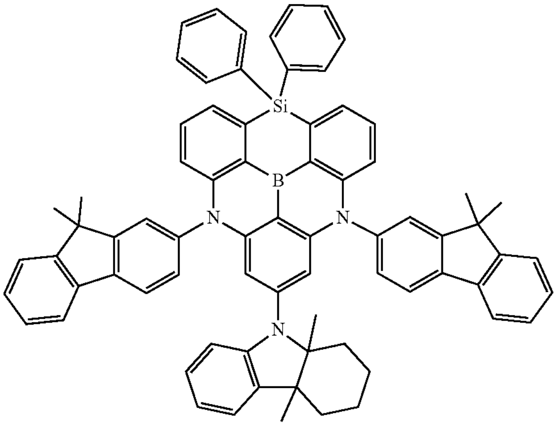
-continued
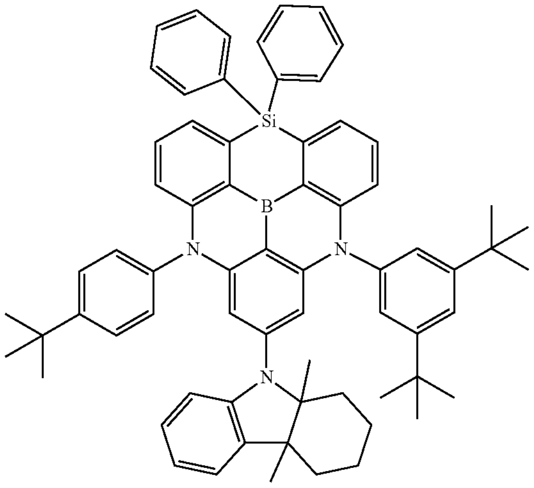
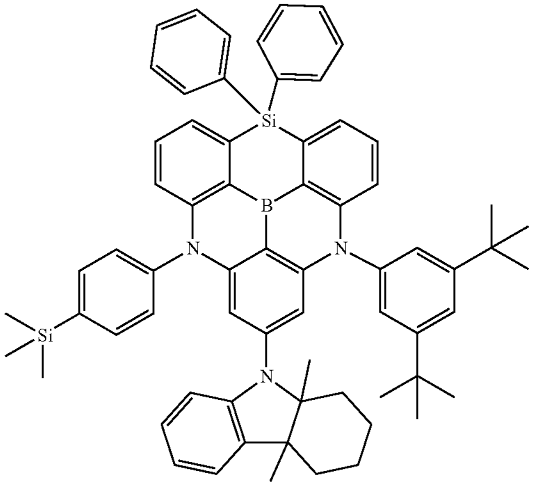
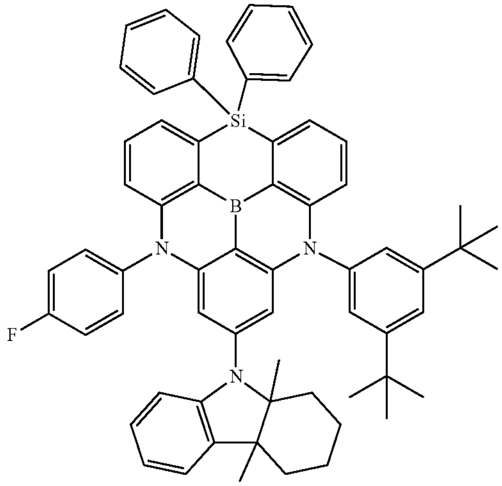

-continued
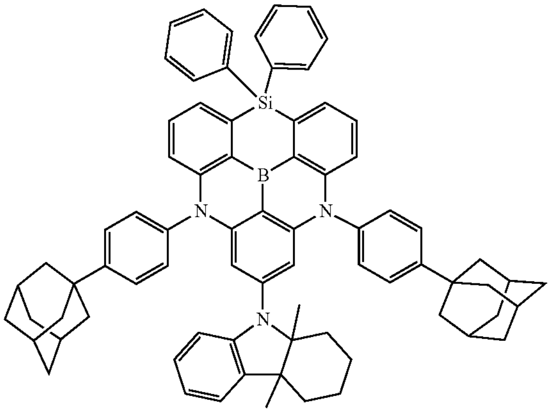
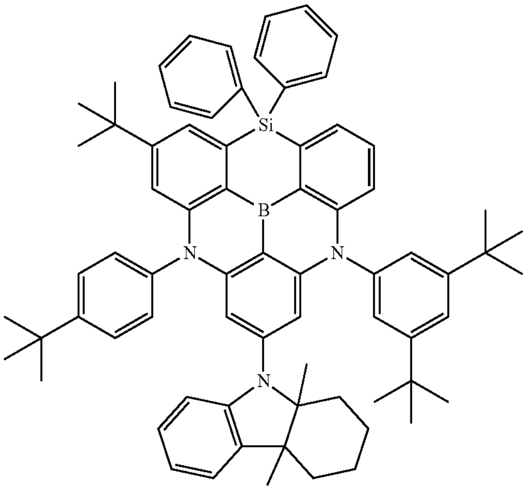
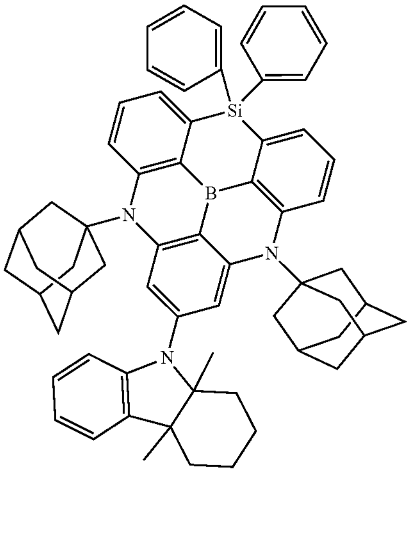
-continued
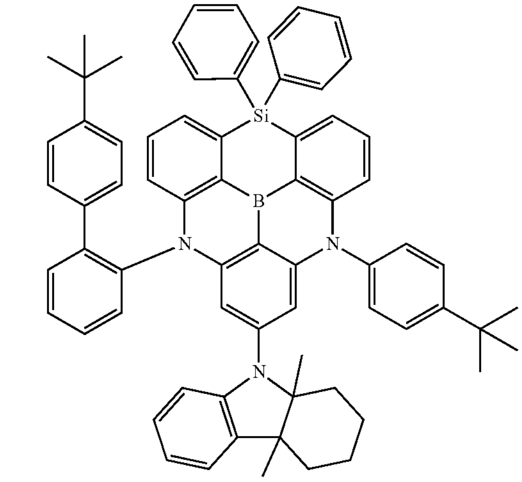
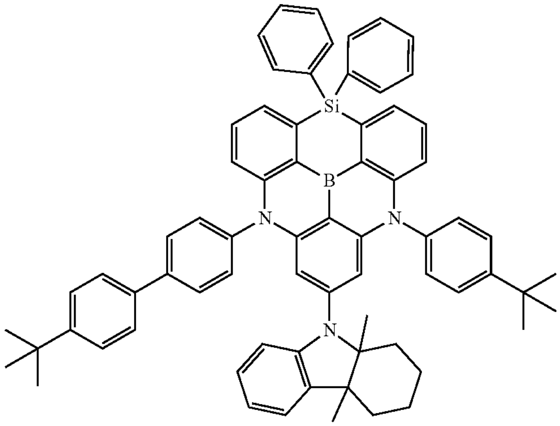 [SMILES: CC(C)(C)c1ccc(-c2ccc(N3c4cc(N5c6ccccc6C6(C)CCCCC56C)cc5c4B4c6c3cccc6[Si](c3ccccc3)(c3ccccc3)c3cccc(c34)N5c3ccc(C(C)(C)C)cc3)cc2)cc1]
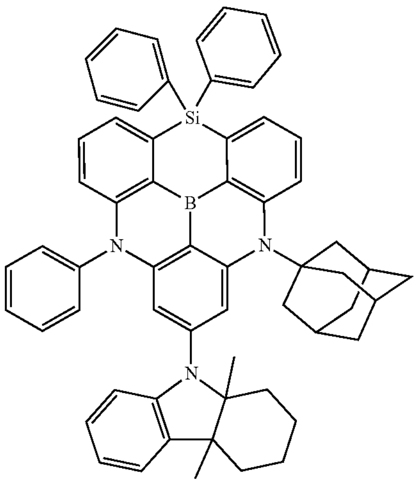

-continued
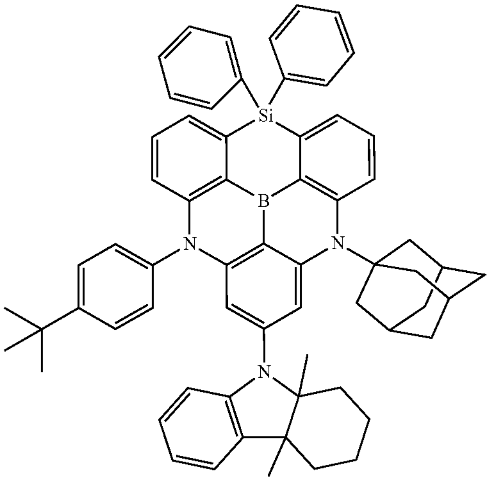
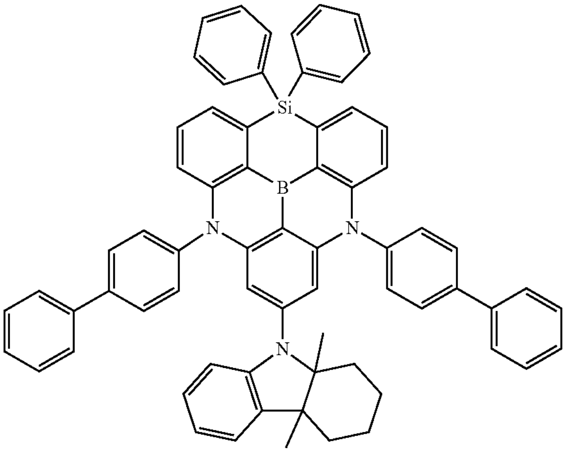
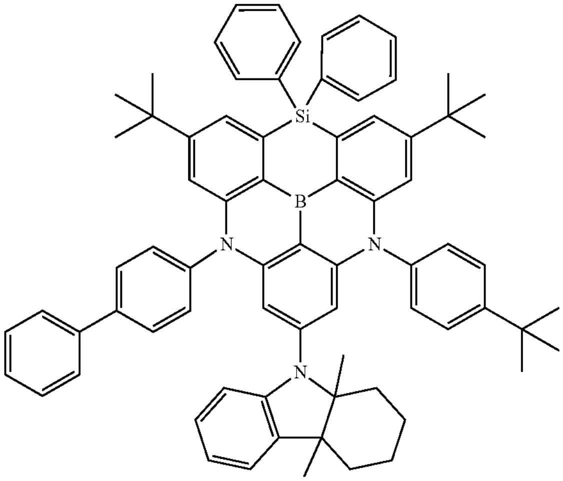
-continued
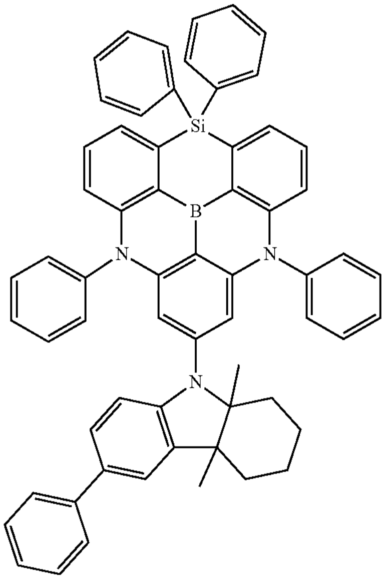
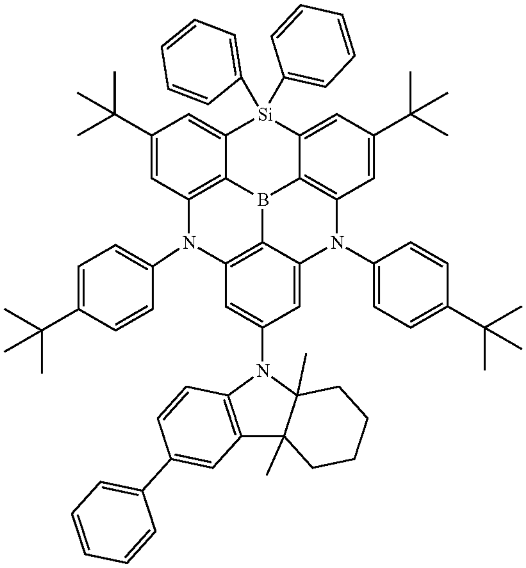
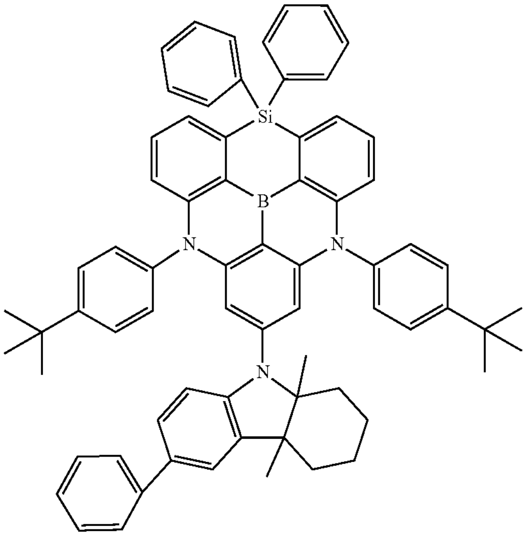

-continued
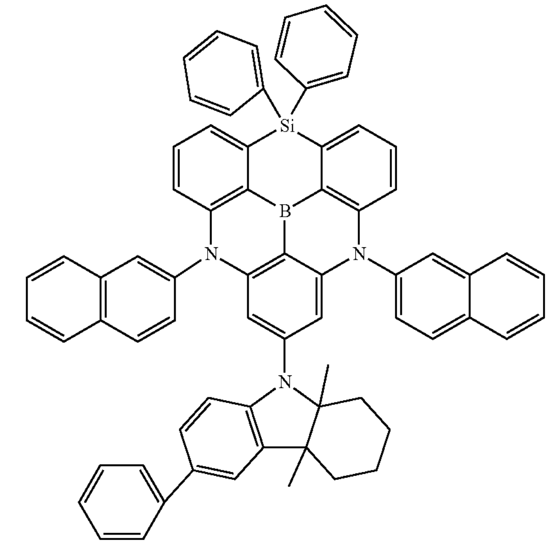
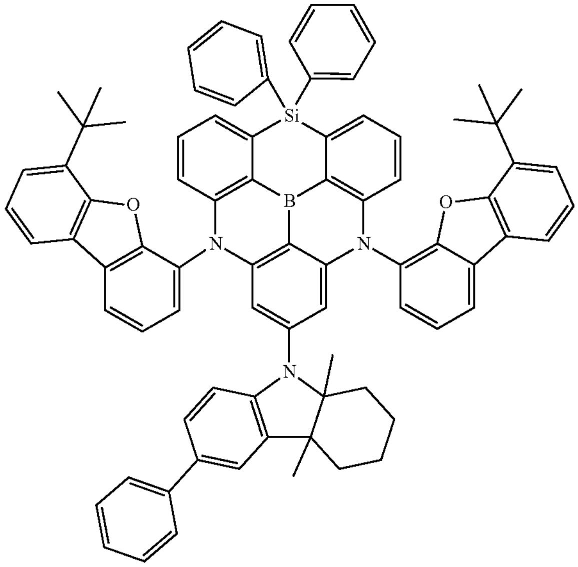
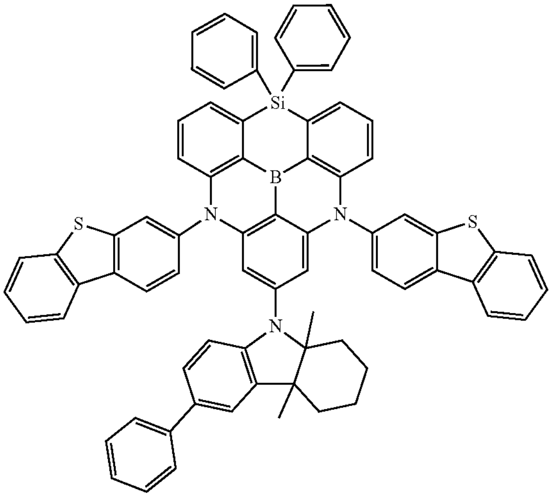
-continued
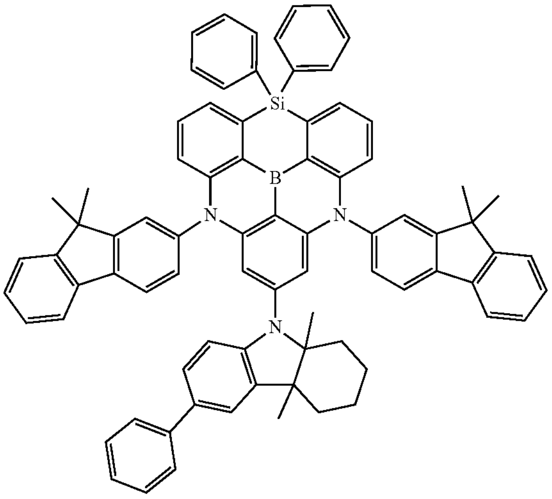
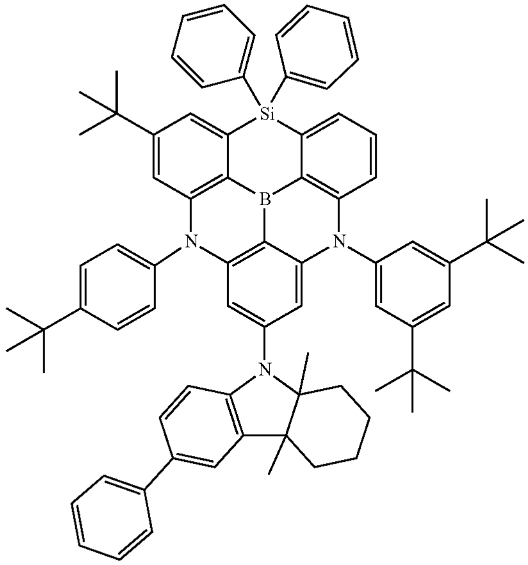
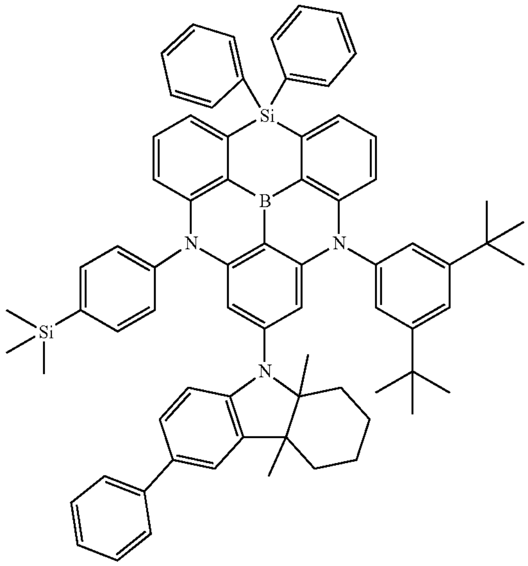

-continued
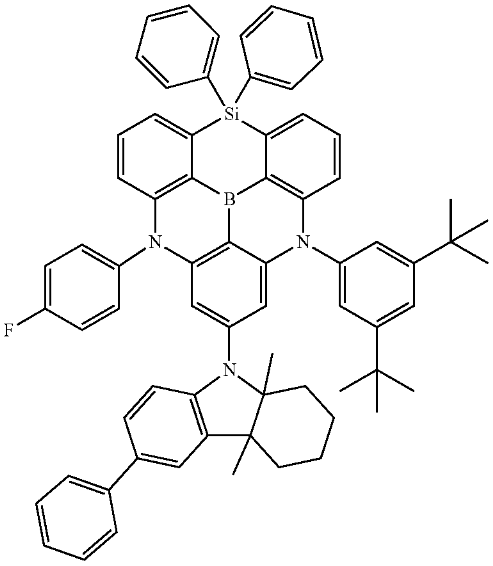
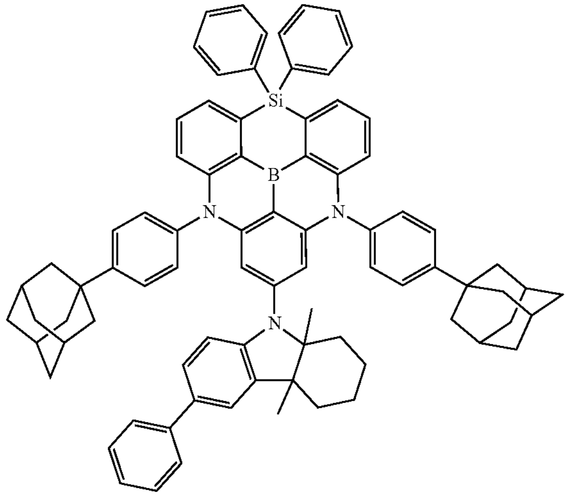
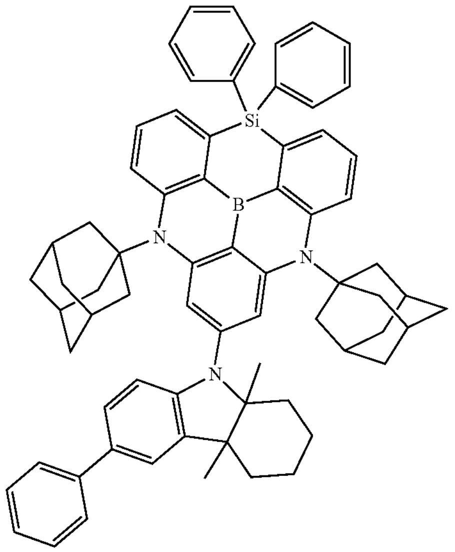
-continued
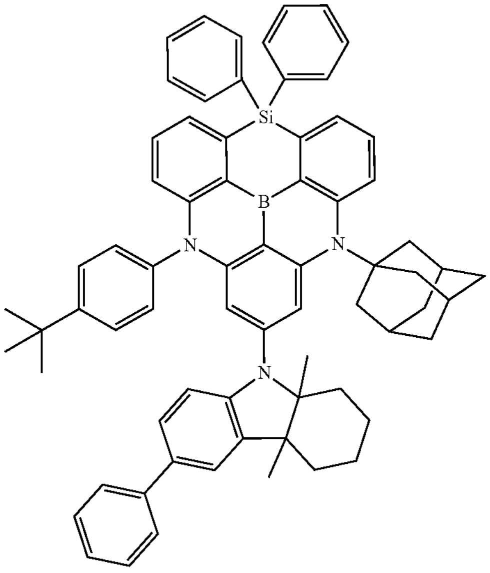
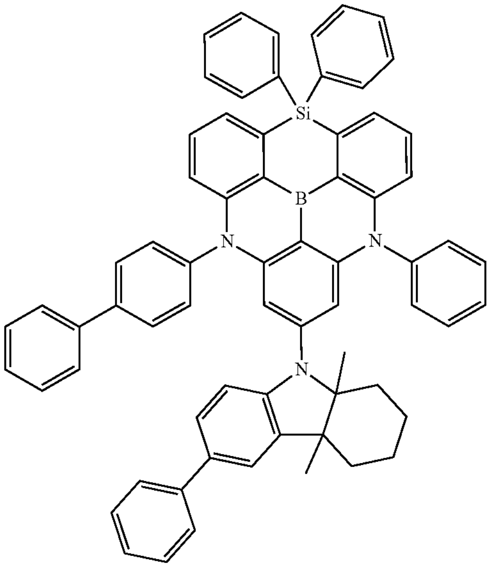
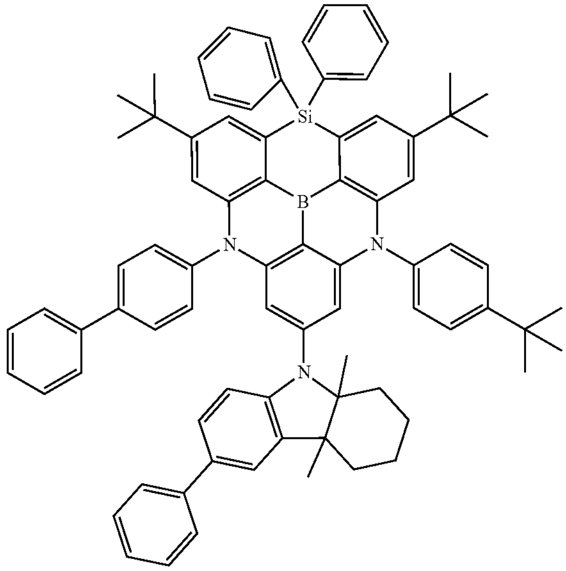

-continued
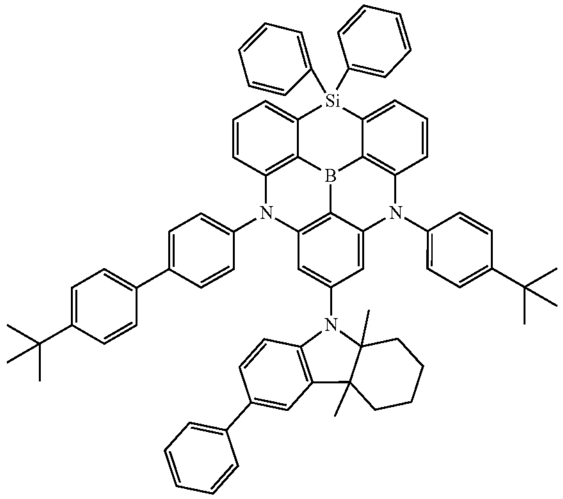
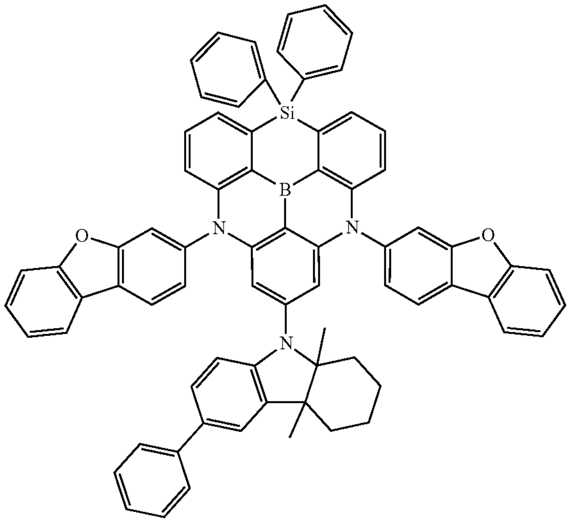
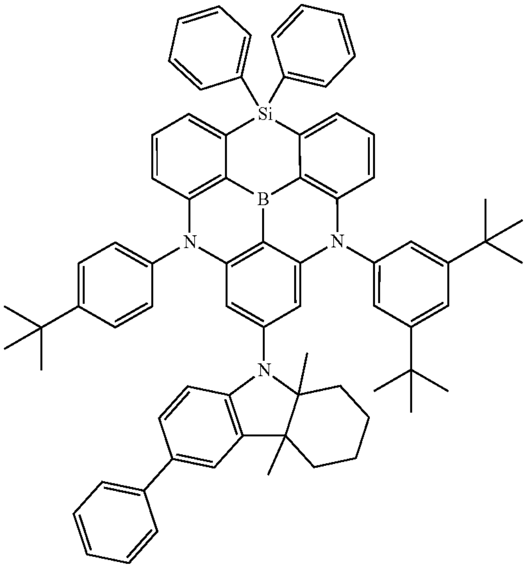
-continued
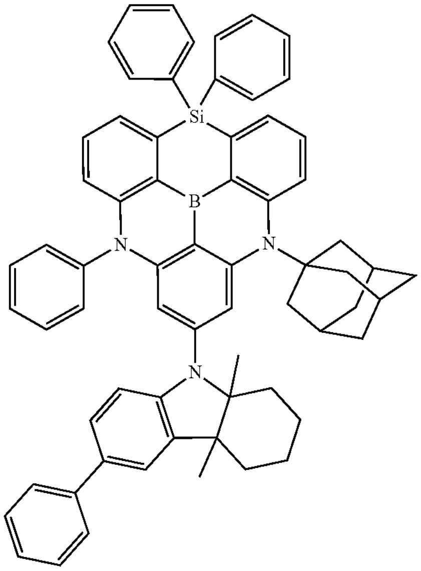
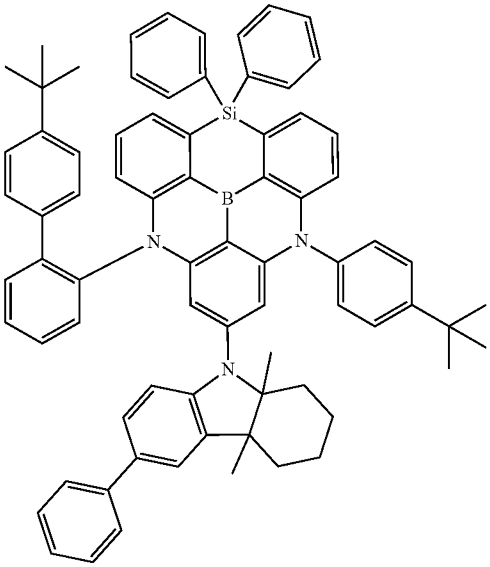
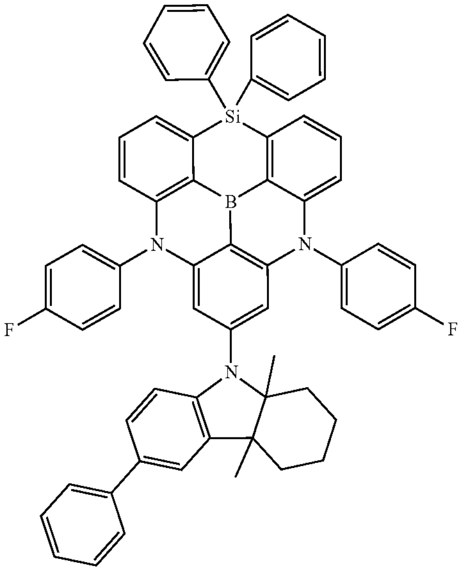

-continued
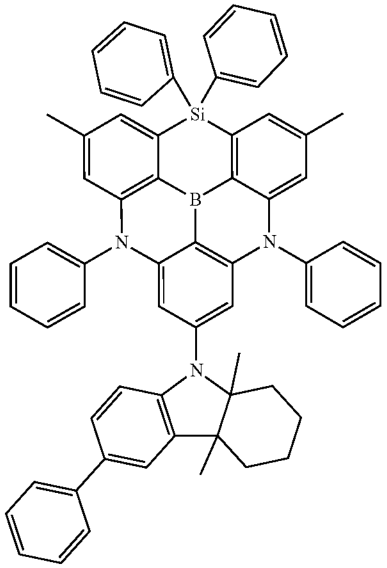
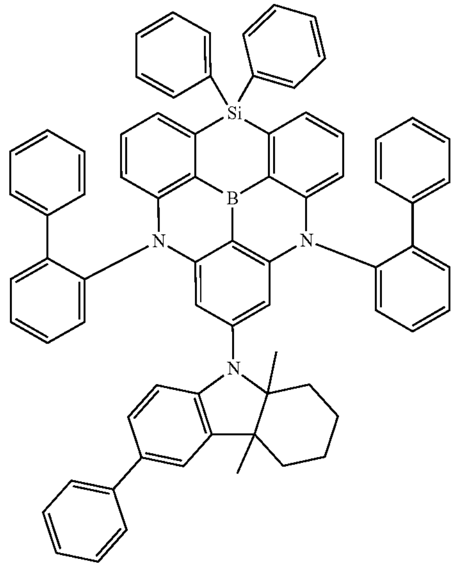
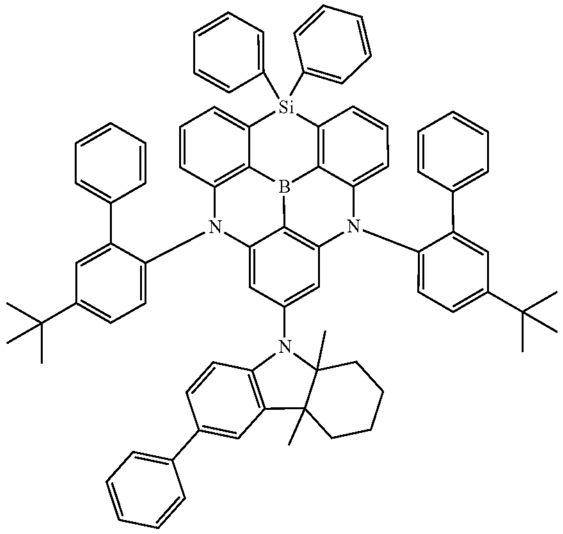
-continued
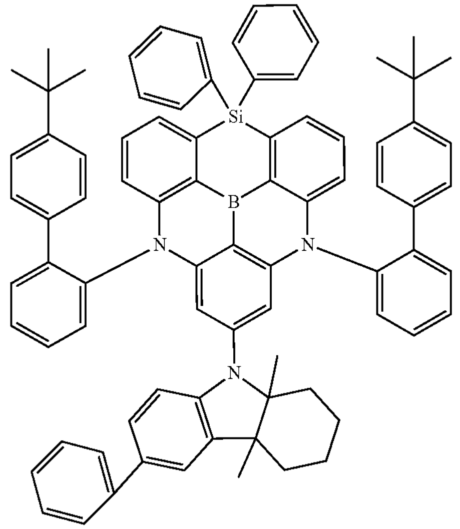
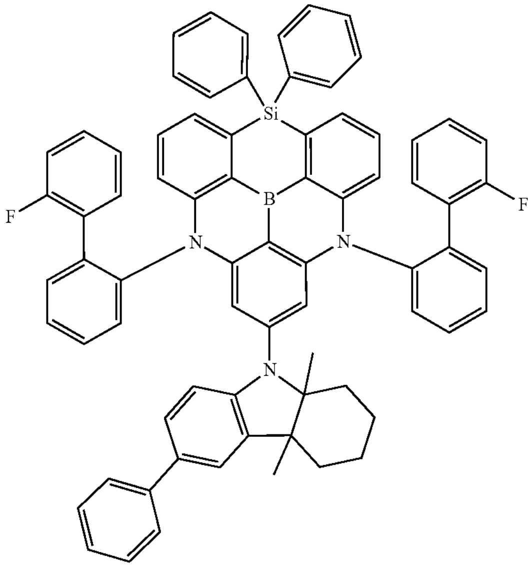
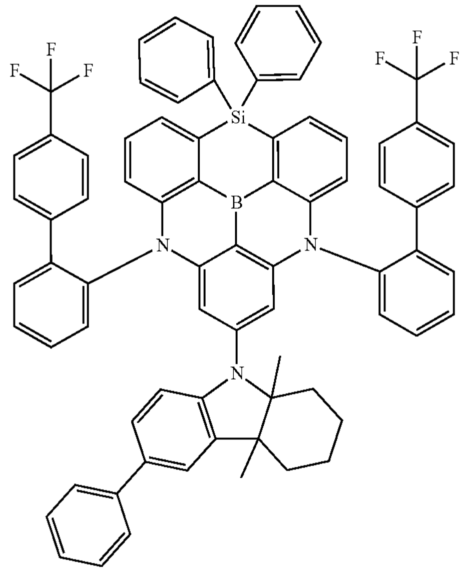

-continued
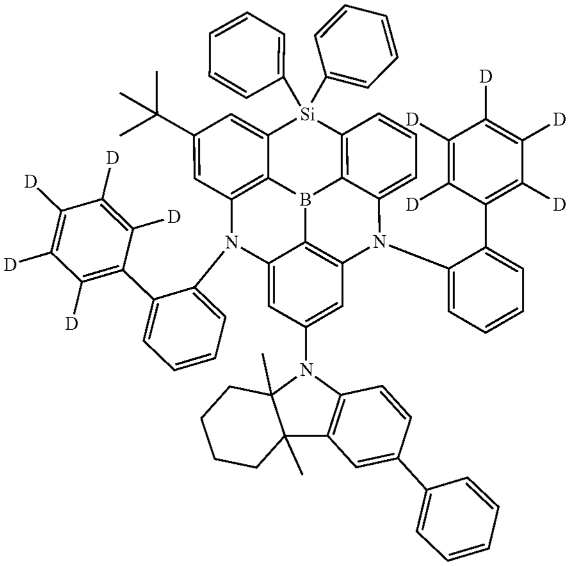
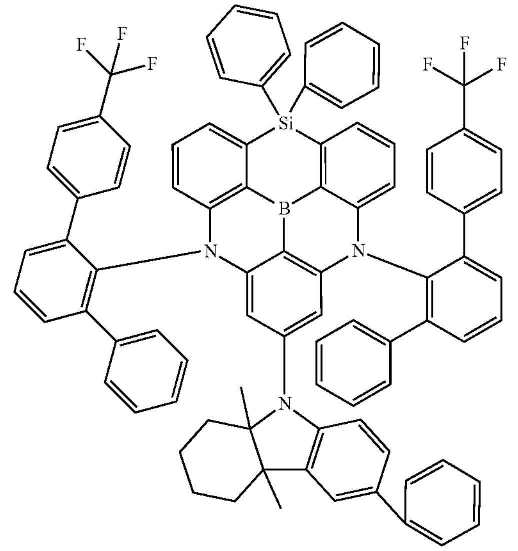
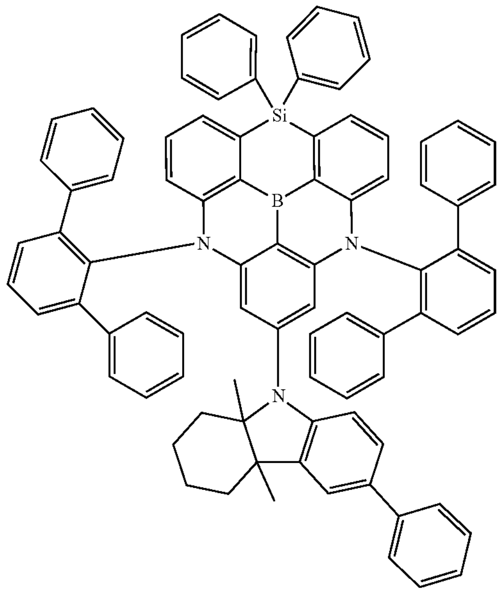
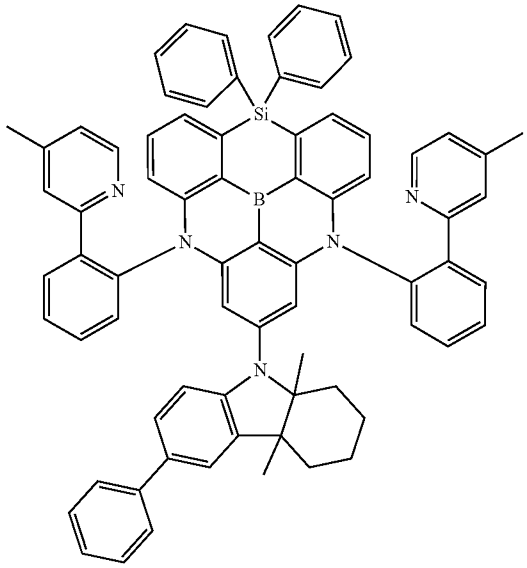
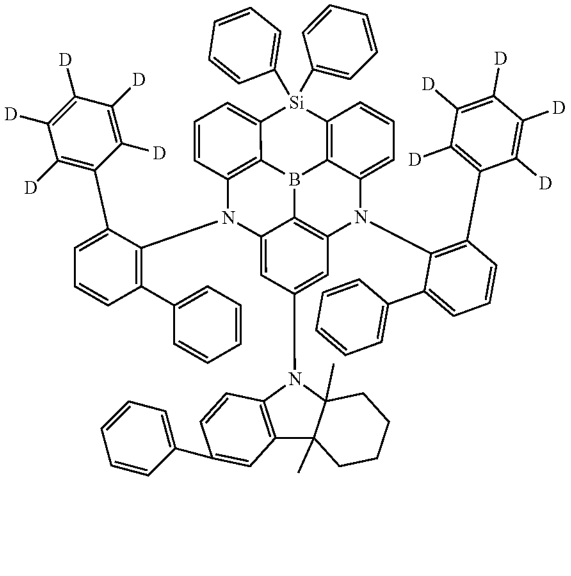
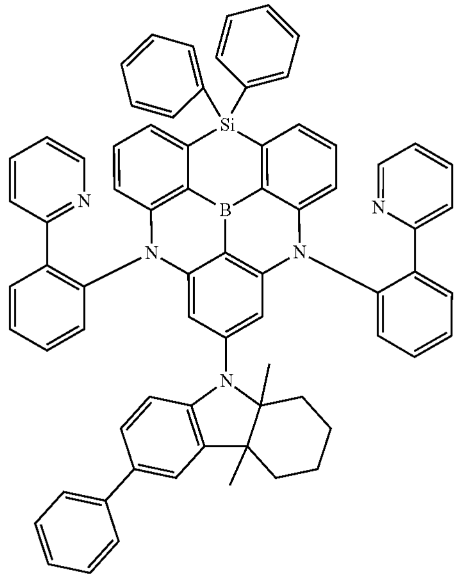
-continued -continued
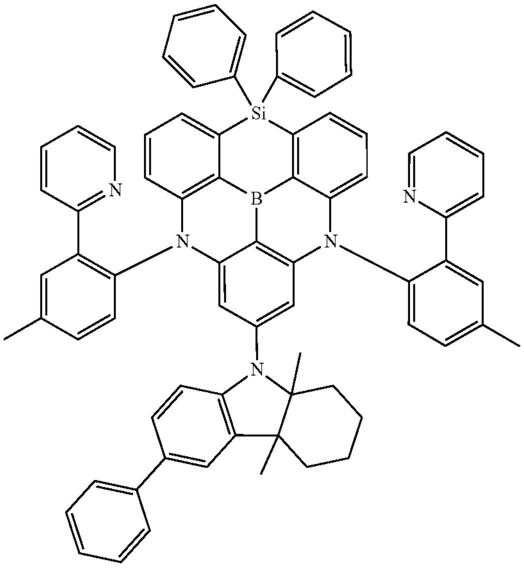
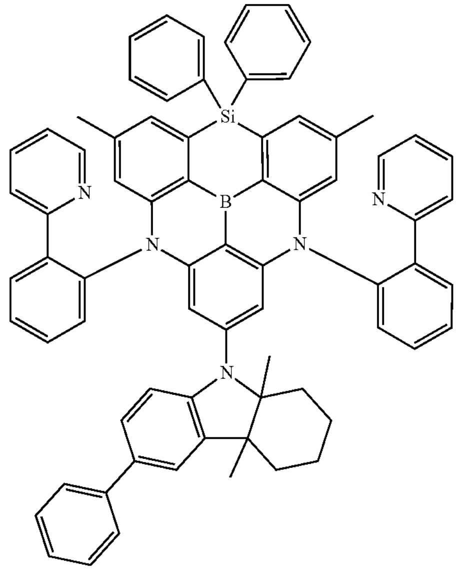
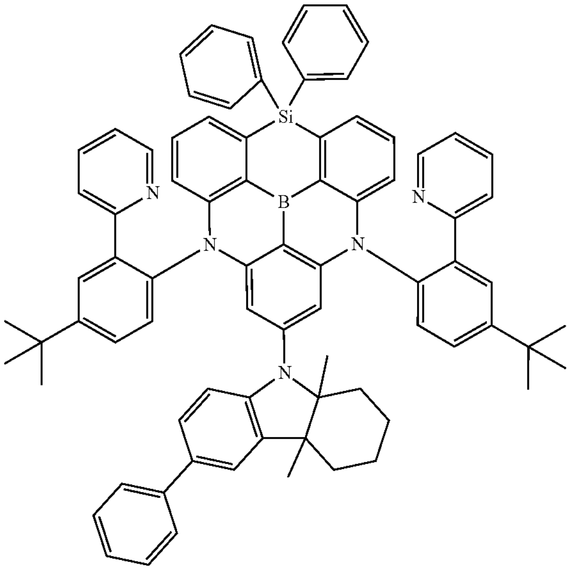
-continued
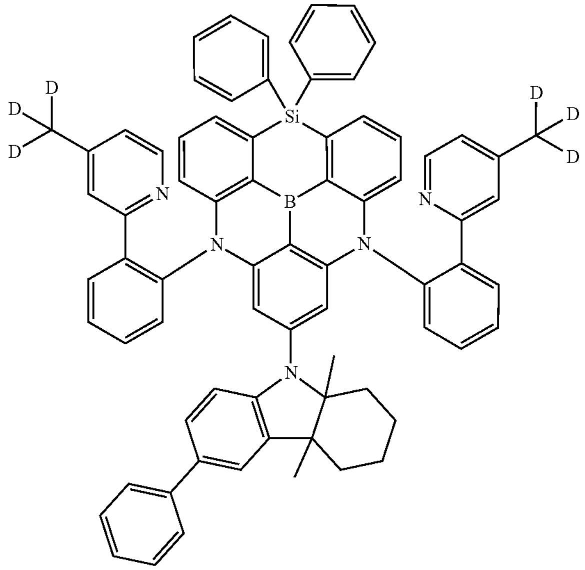
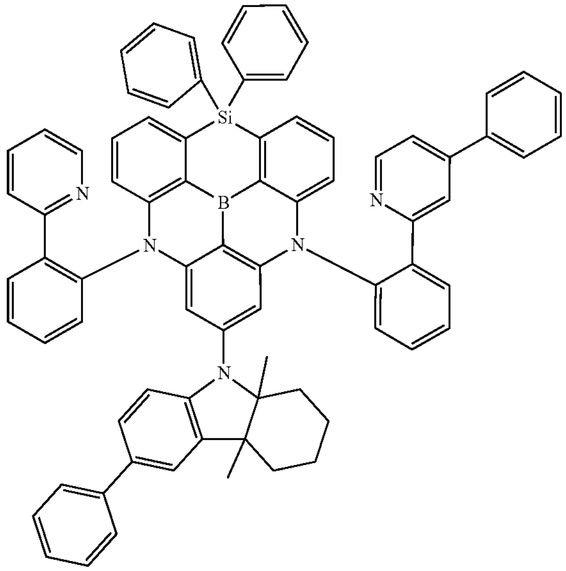
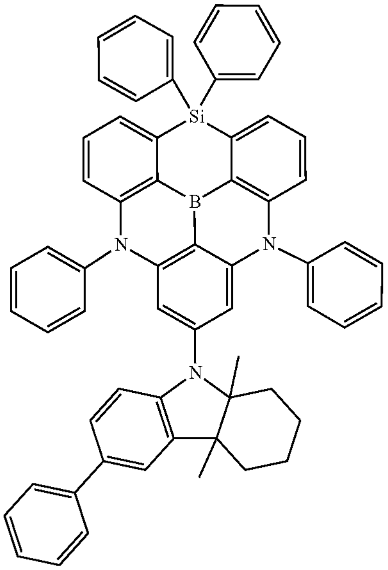

-continued
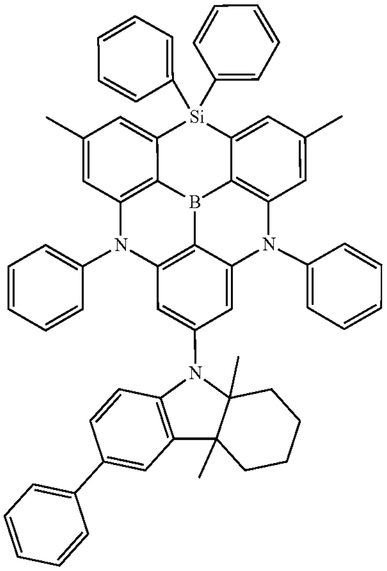
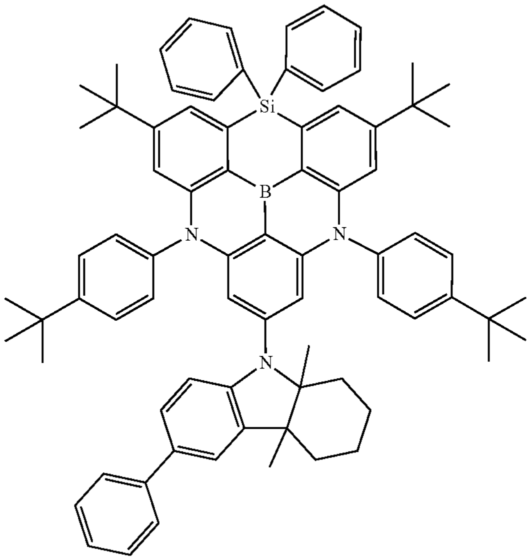
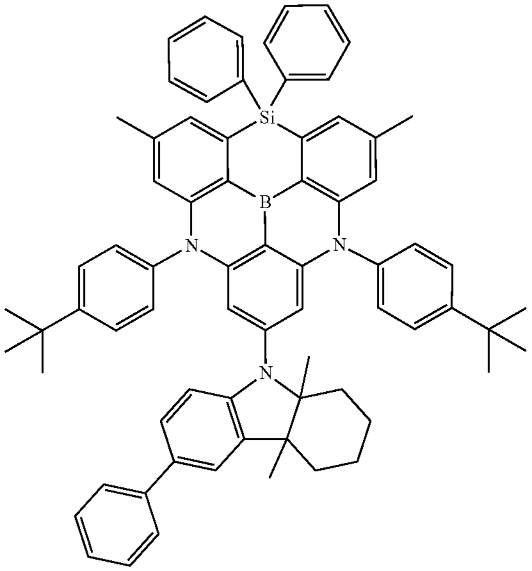
-continued
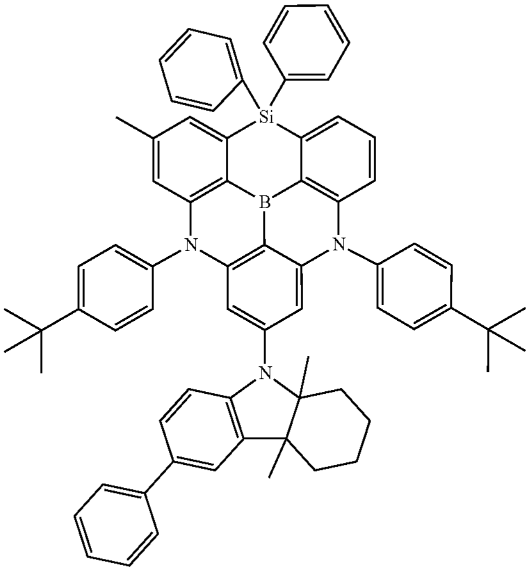
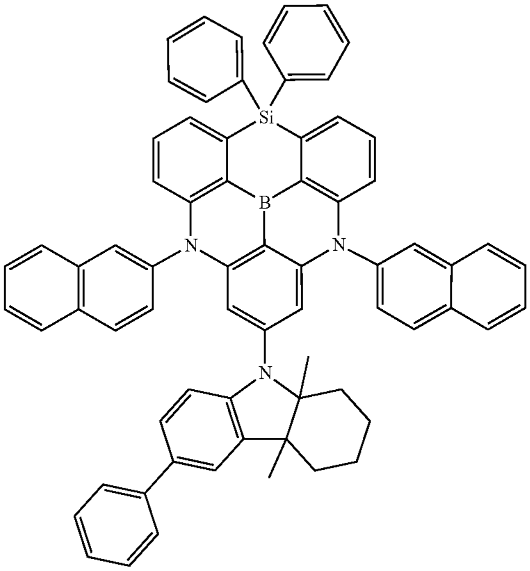
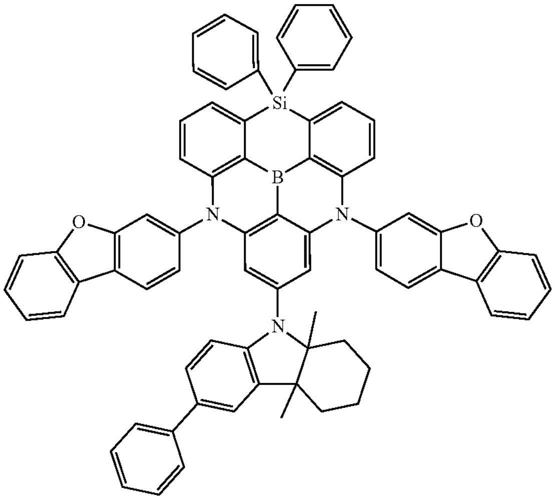

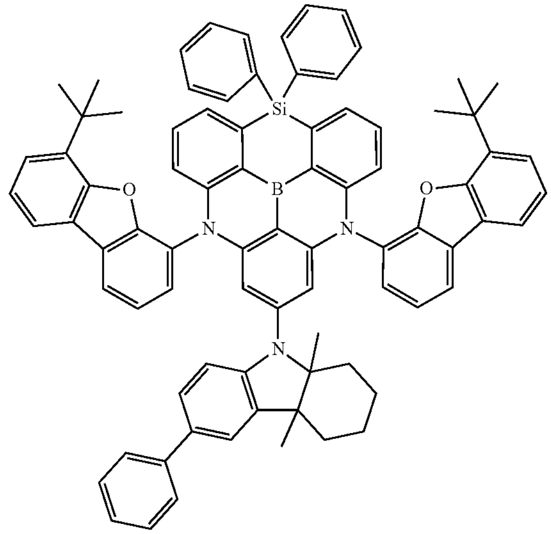
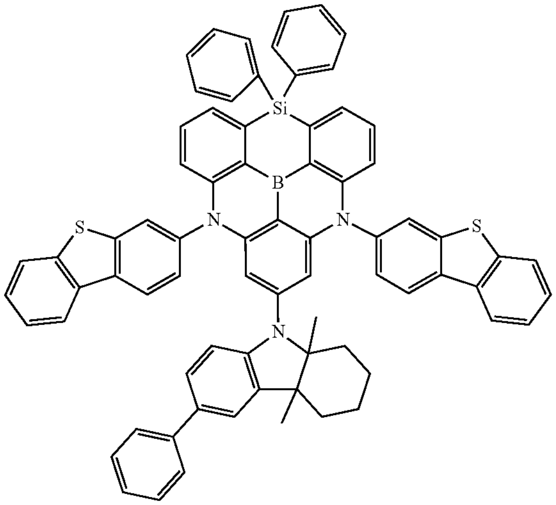
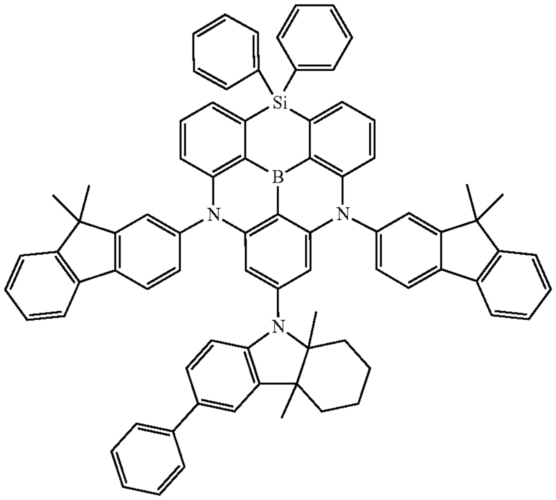
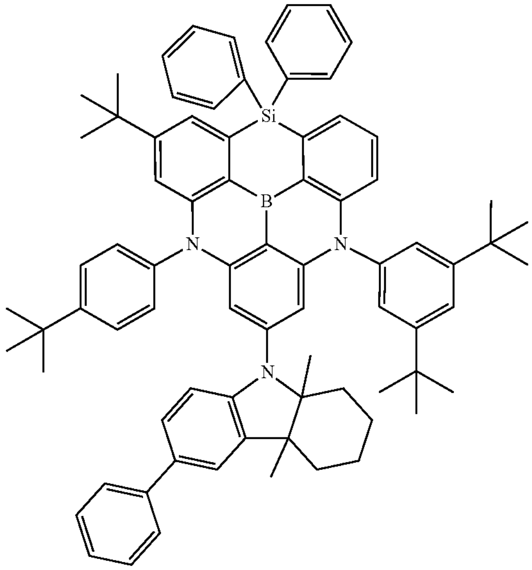
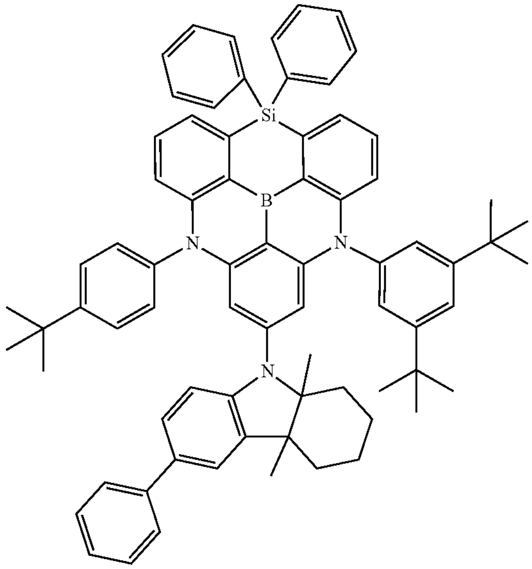
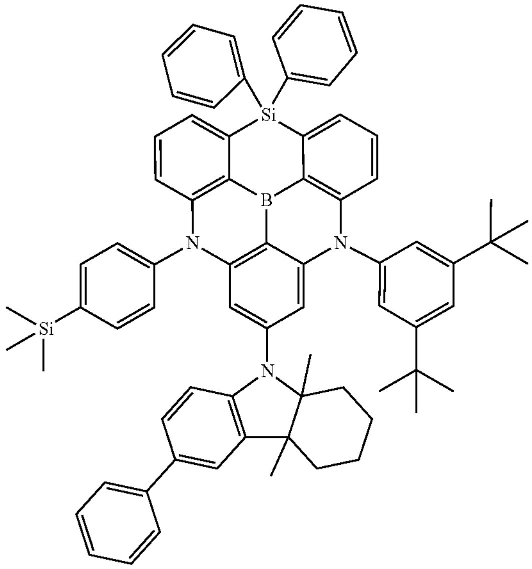

-continued
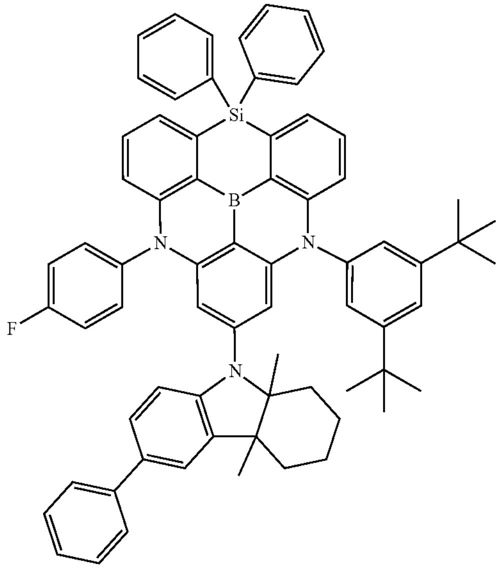
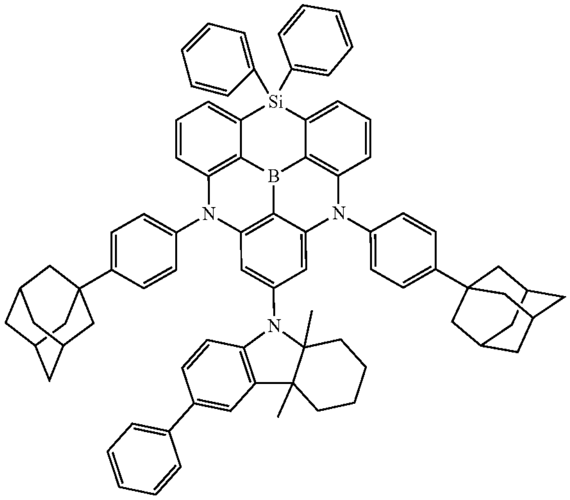
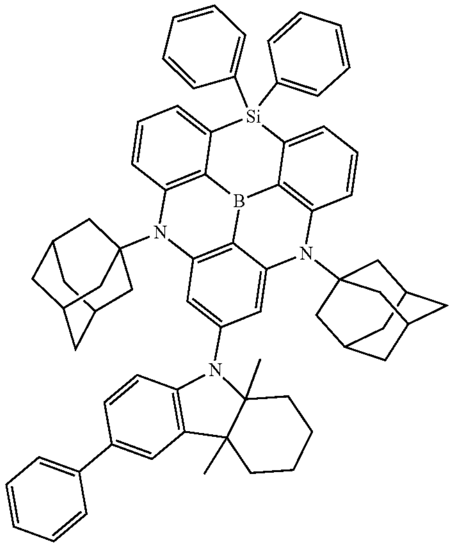
-continued
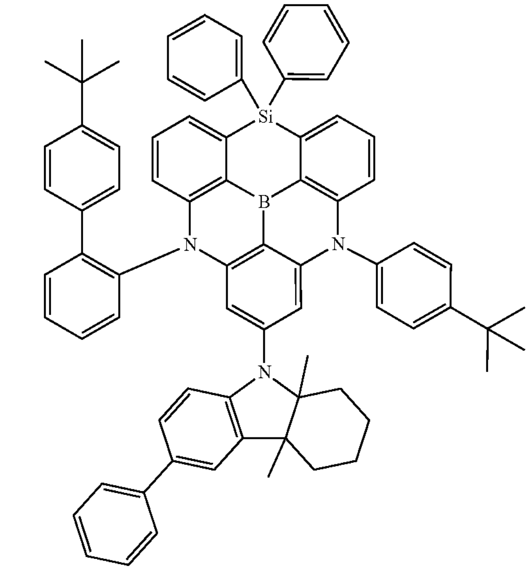
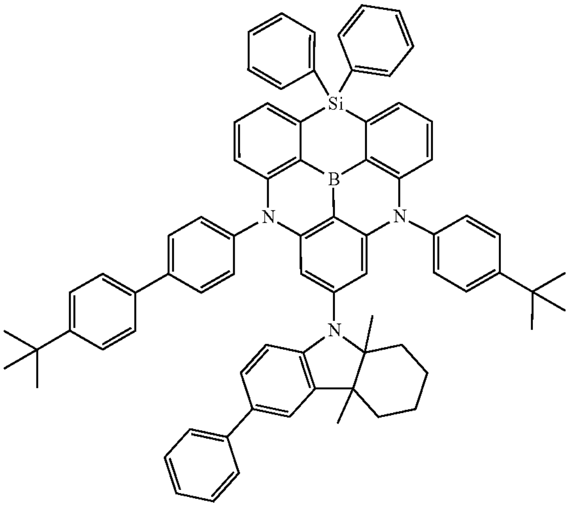
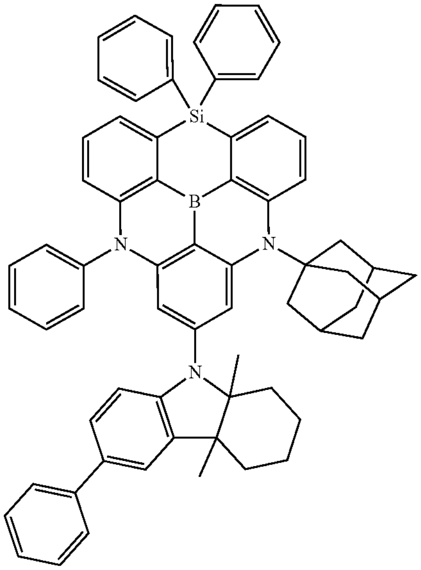

-continued
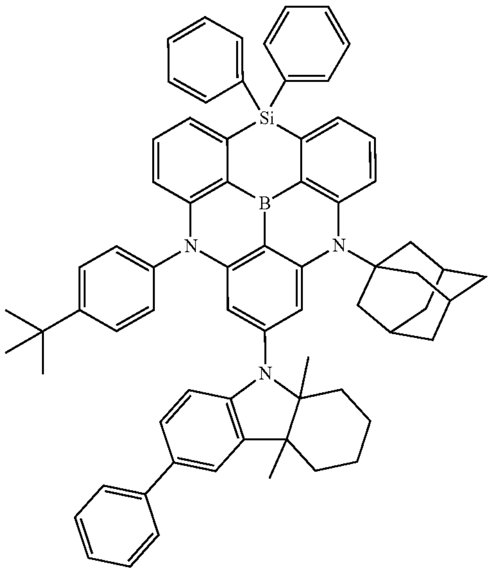
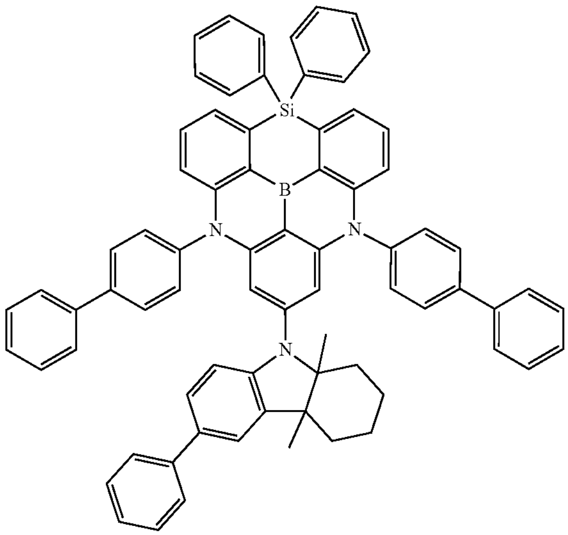
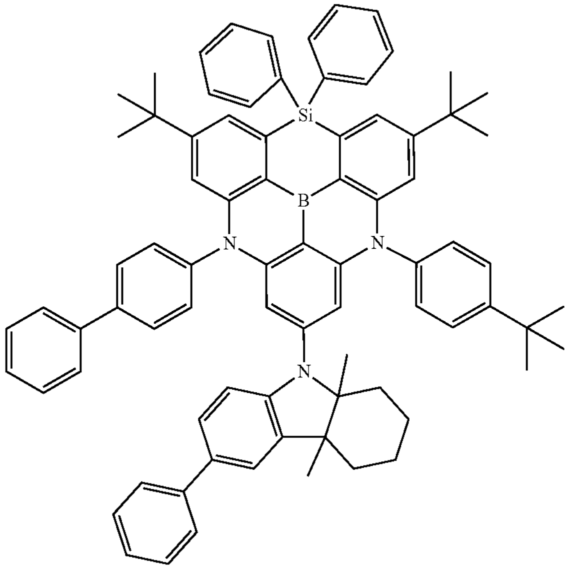
-continued
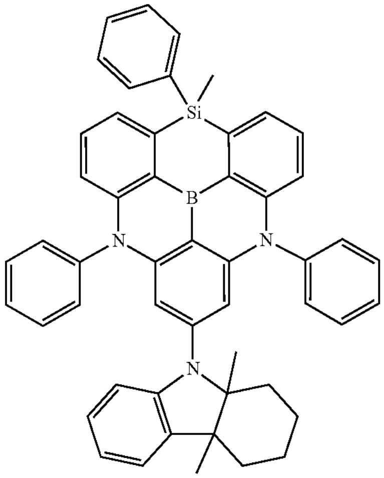
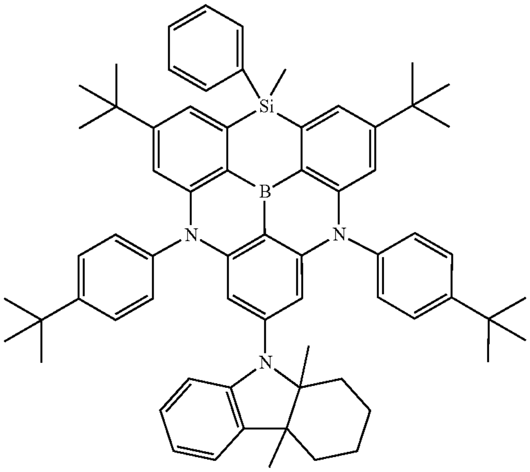
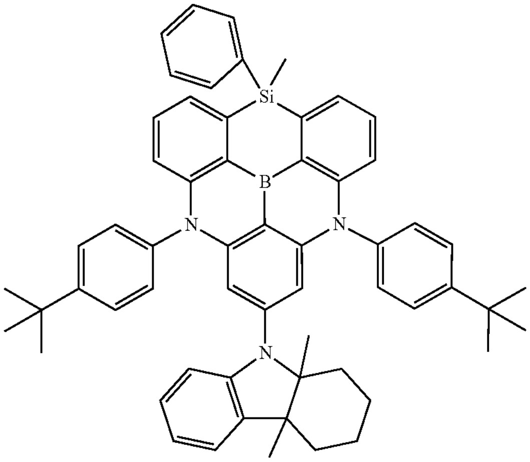

-continued
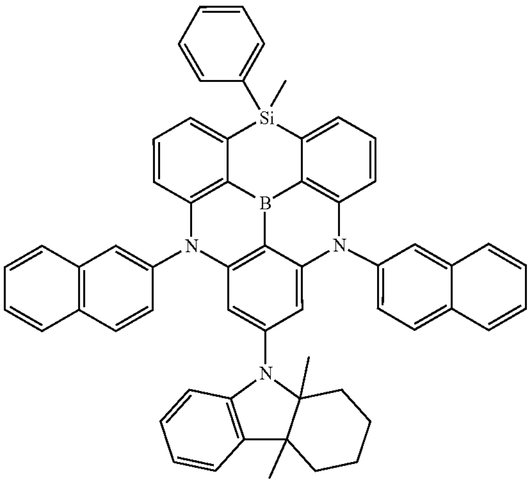
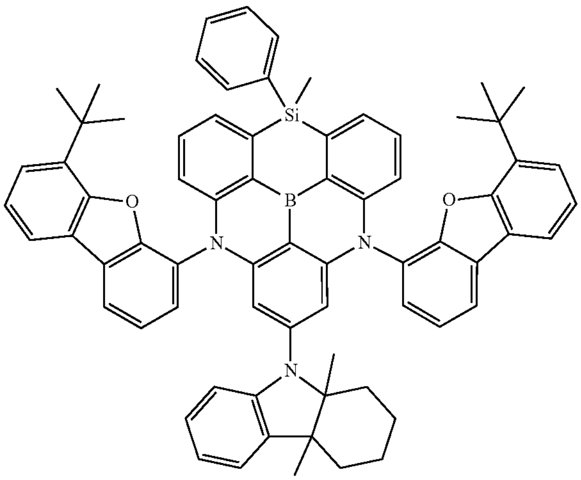
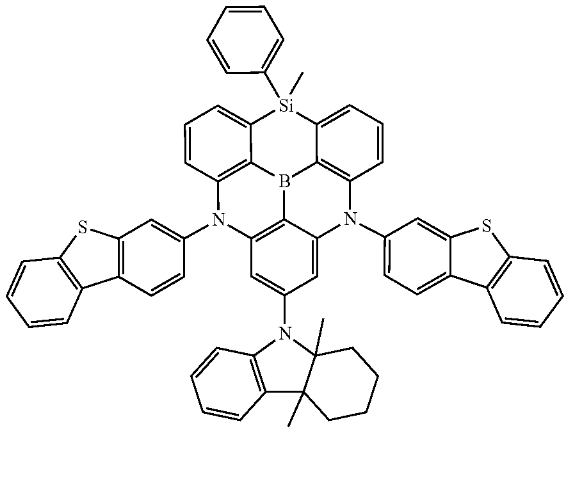
-continued
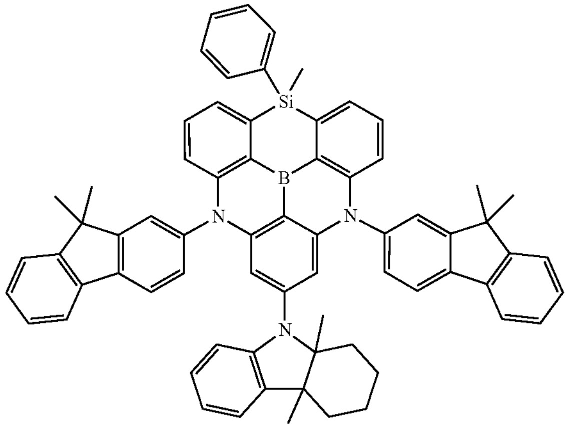
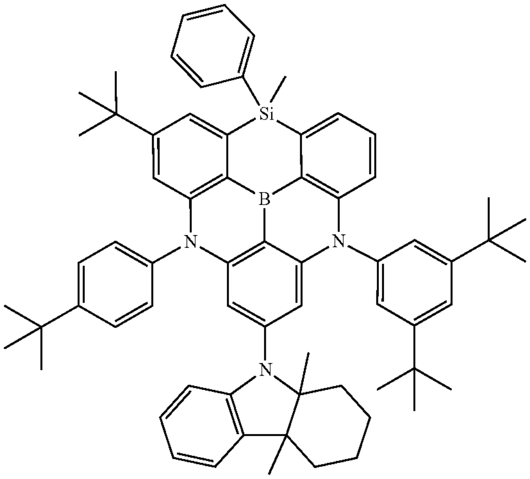
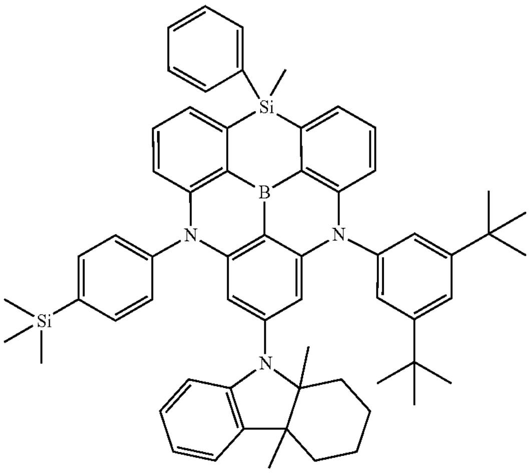

-continued
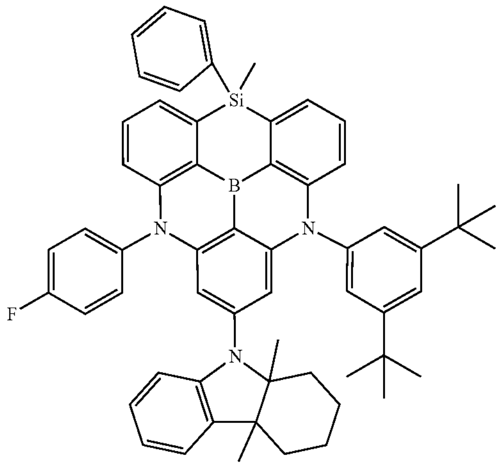
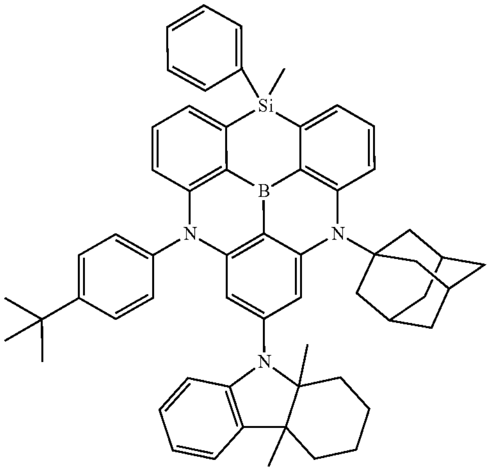
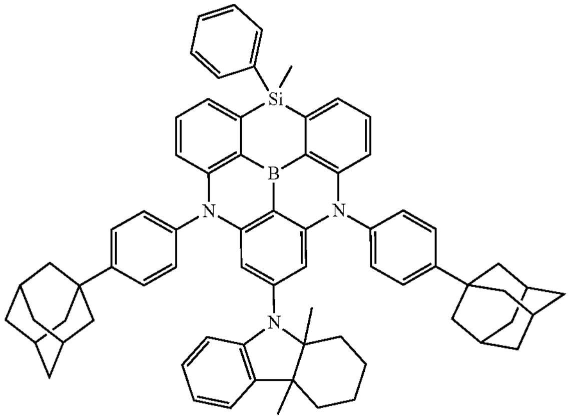
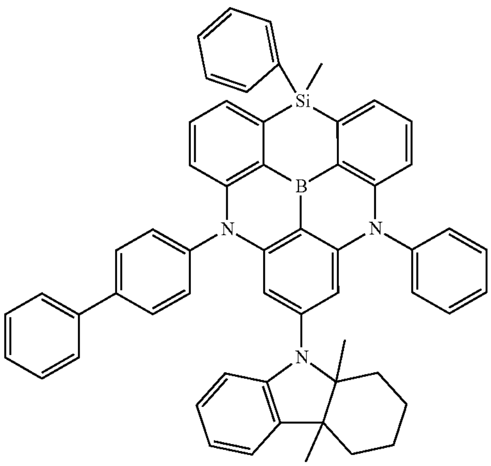
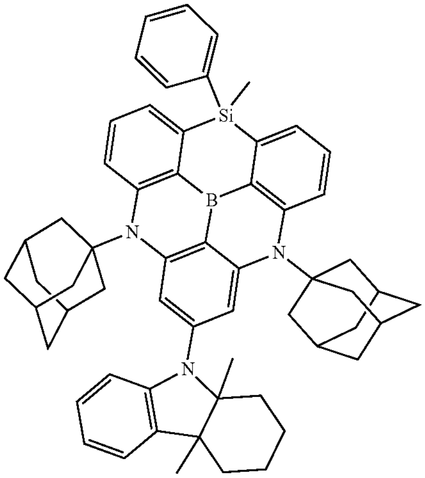
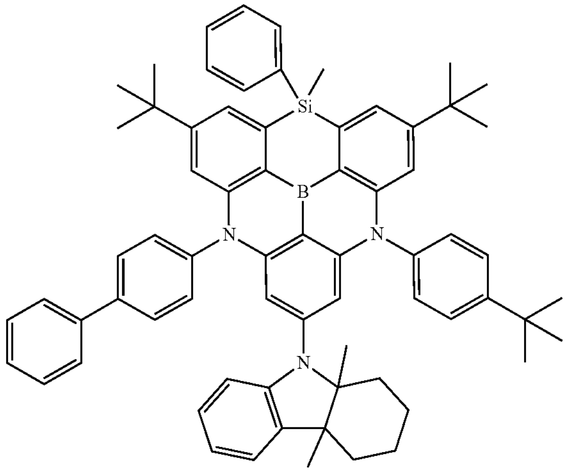
-continued -continued
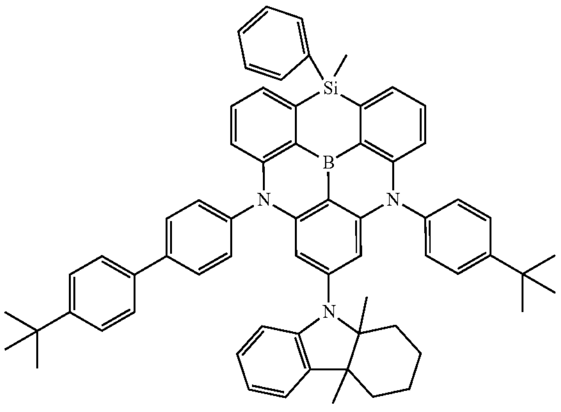
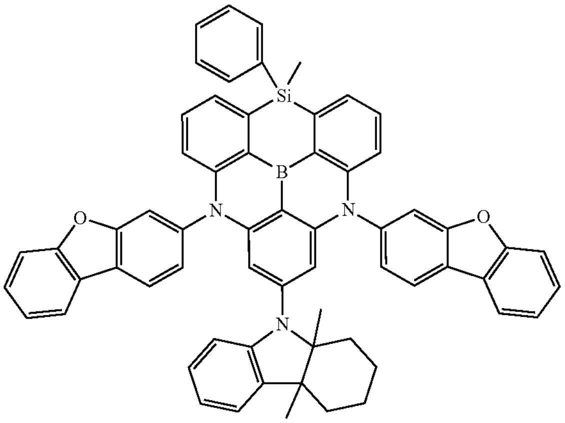
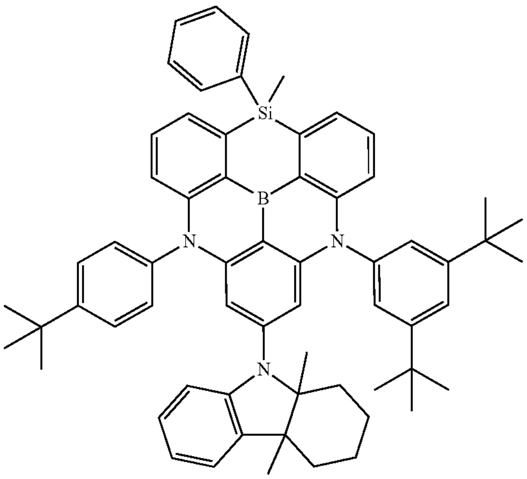
-continued
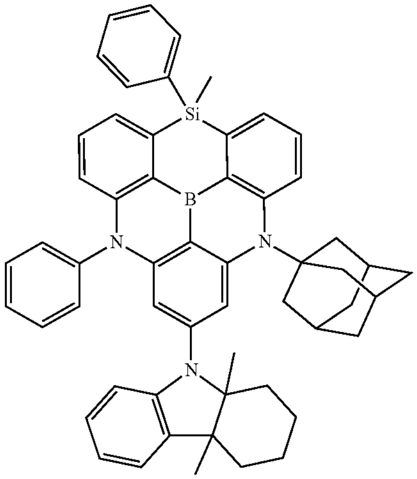
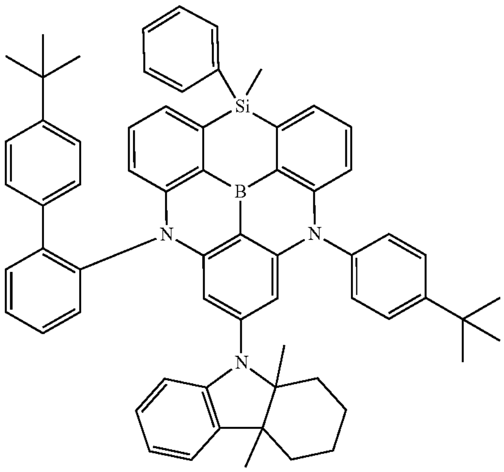
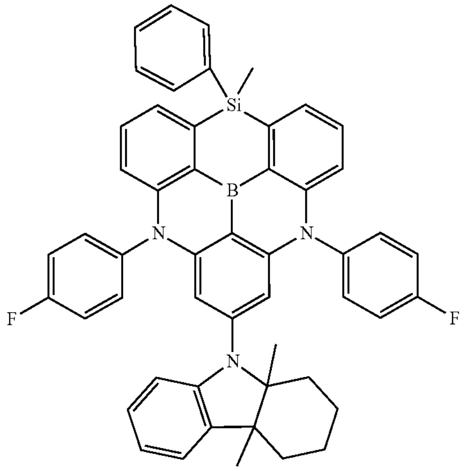

-continued
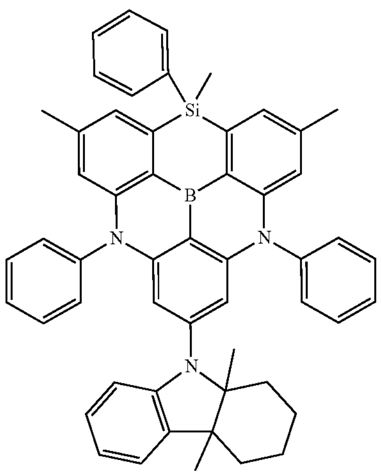
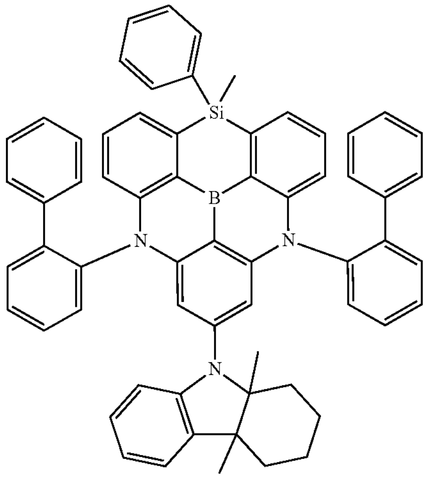
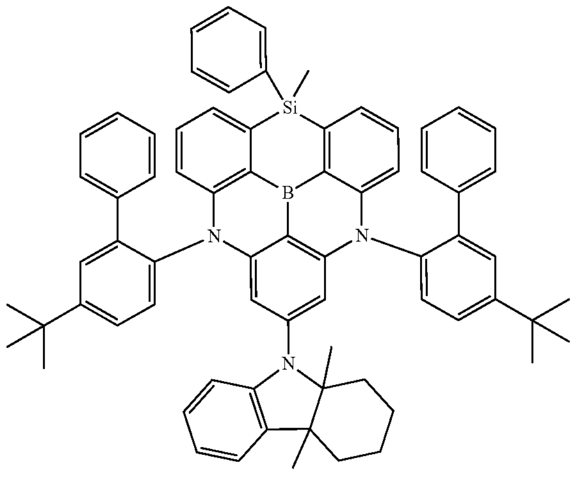
-continued
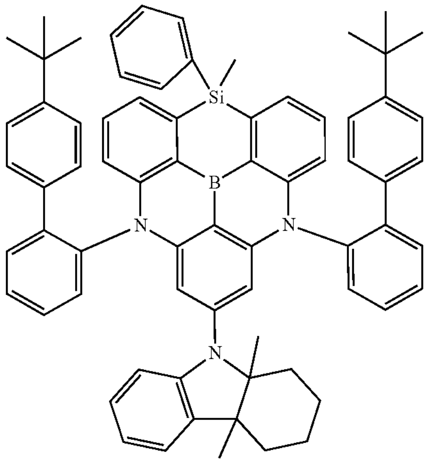
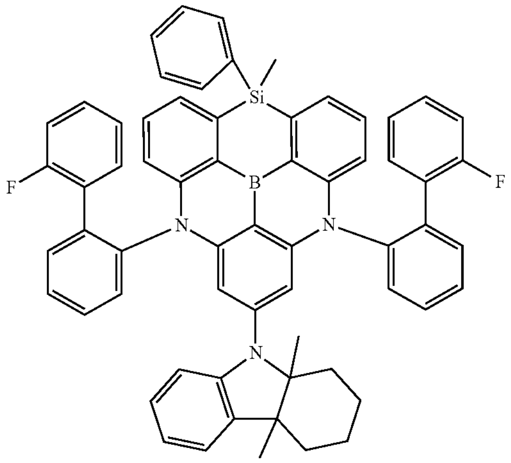
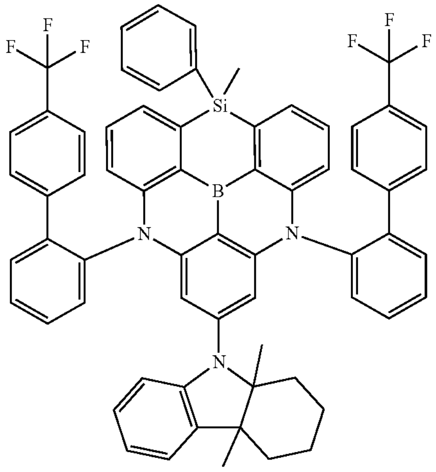

-continued
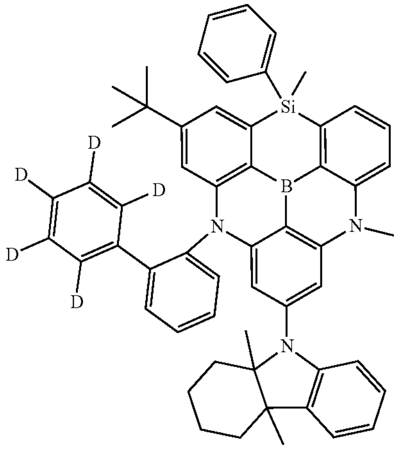
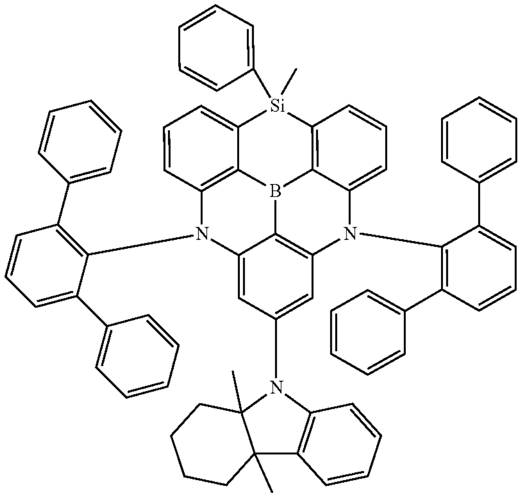
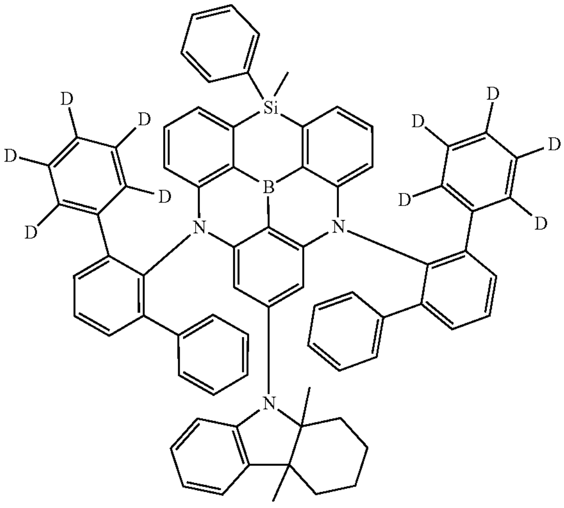
-continued
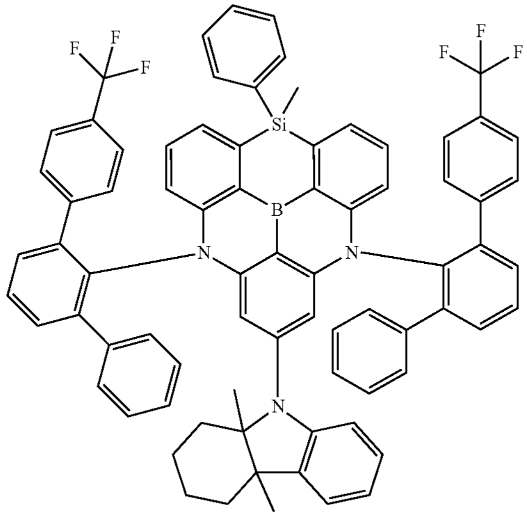
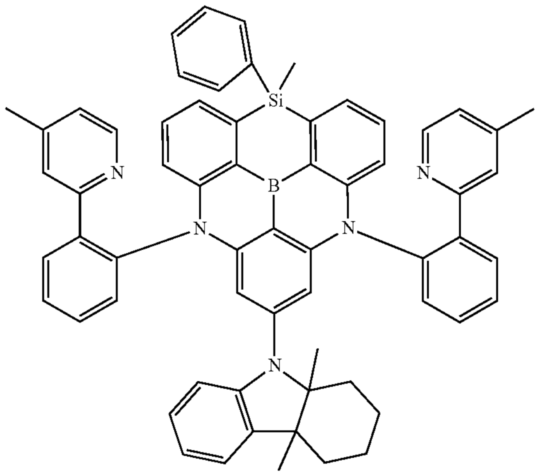
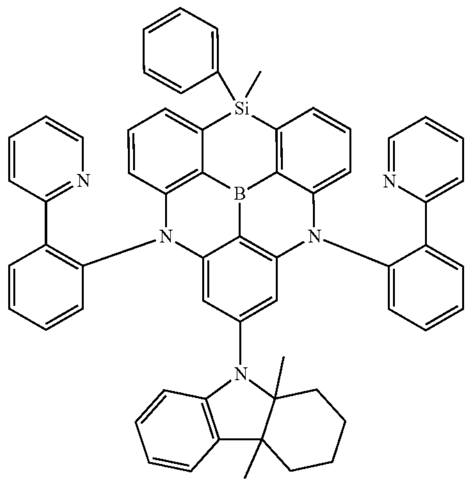

-continued
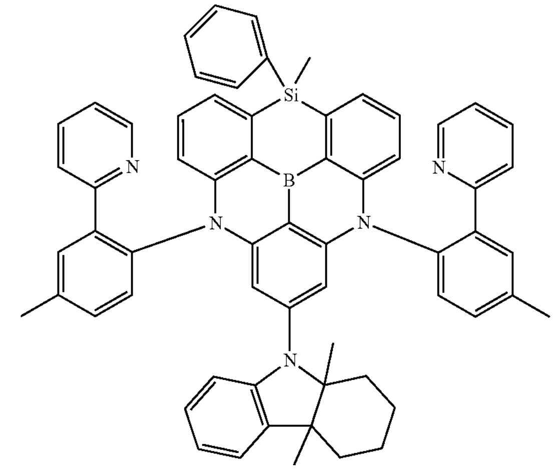
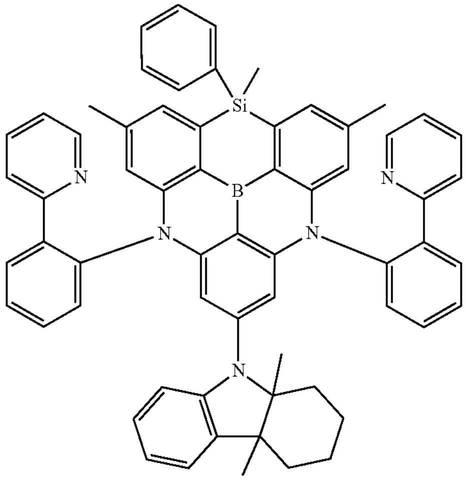
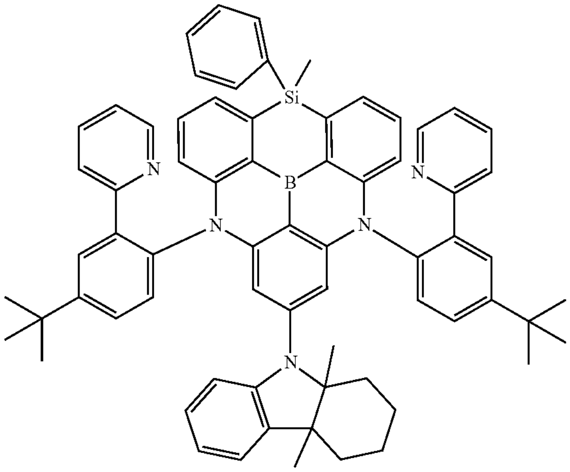
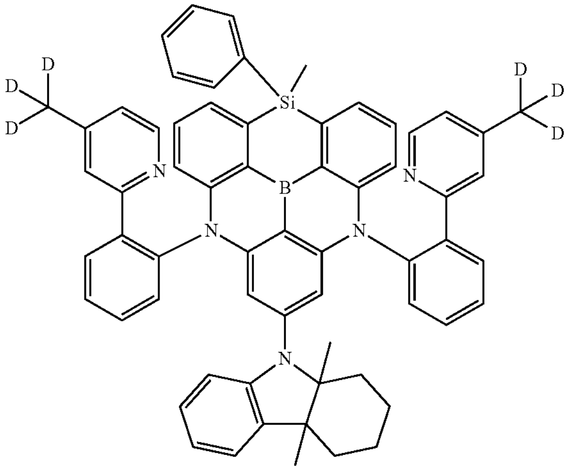
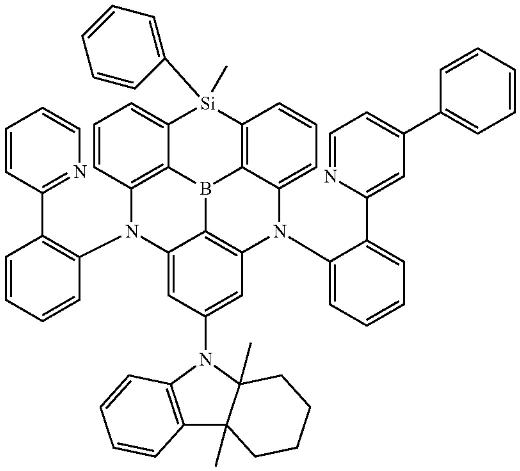
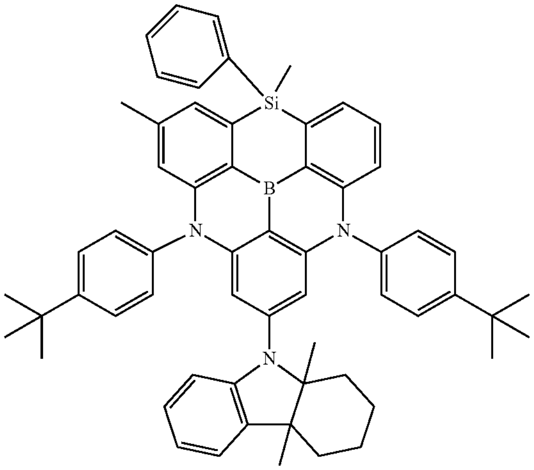

-continued
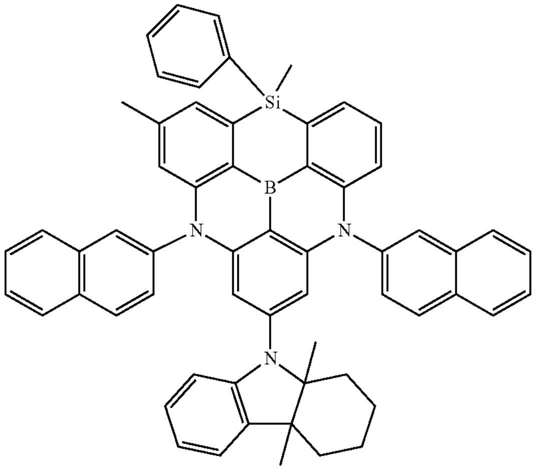
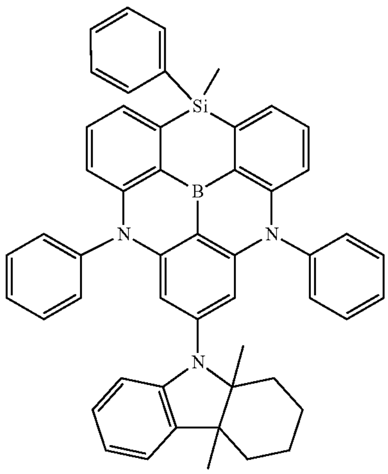
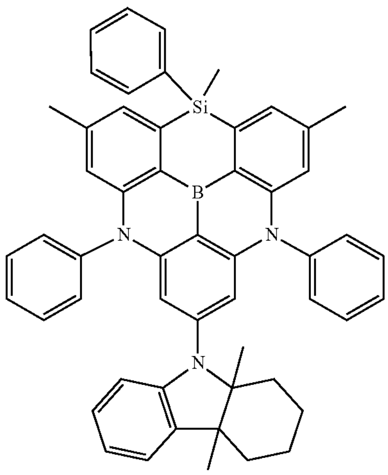
-continued
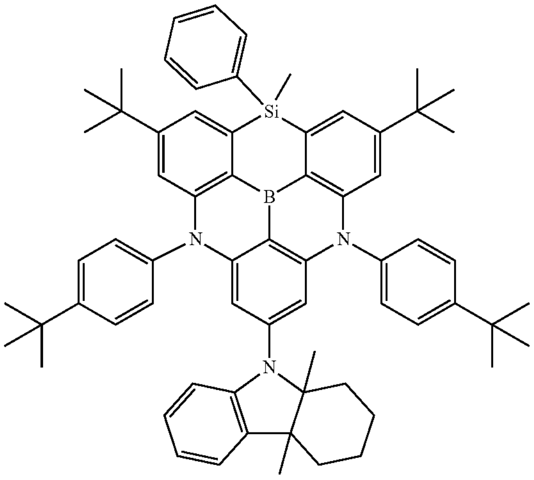
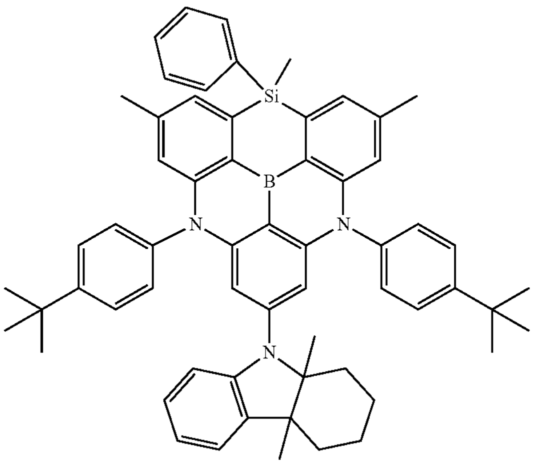
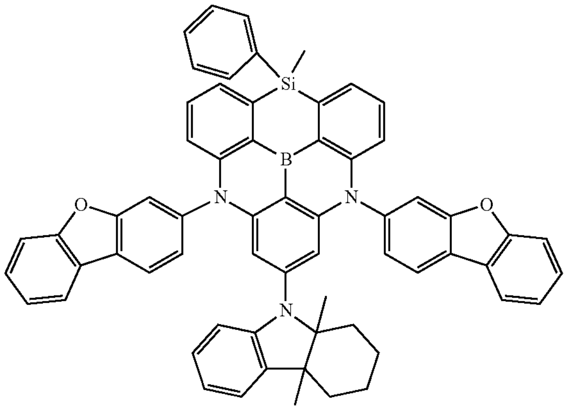

-continued
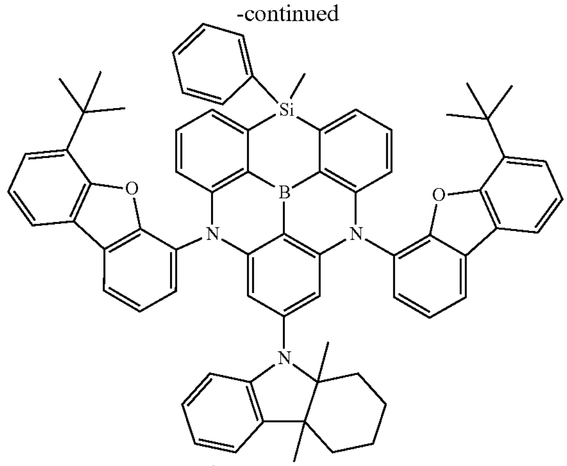
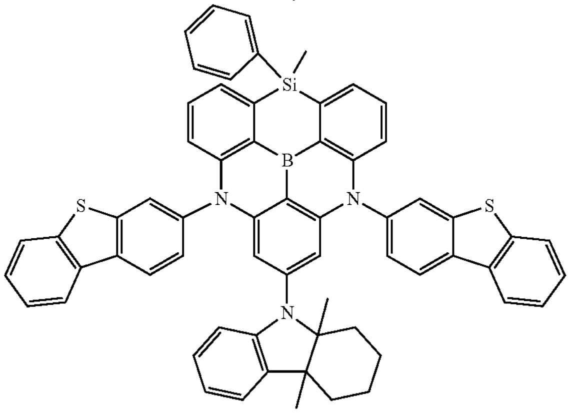
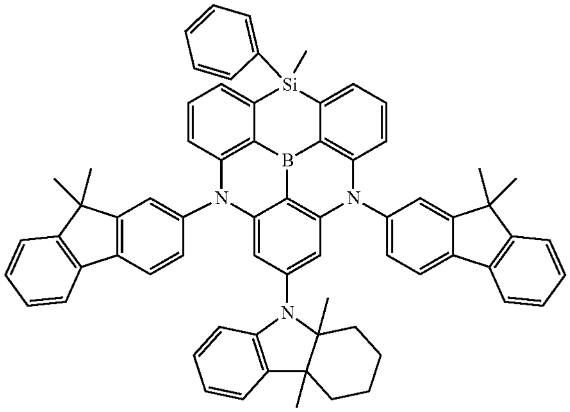
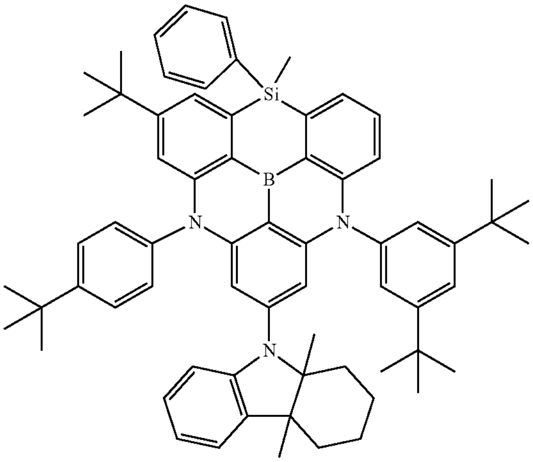
-continued
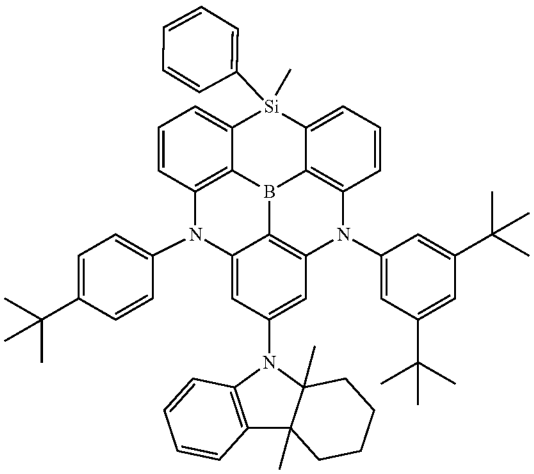
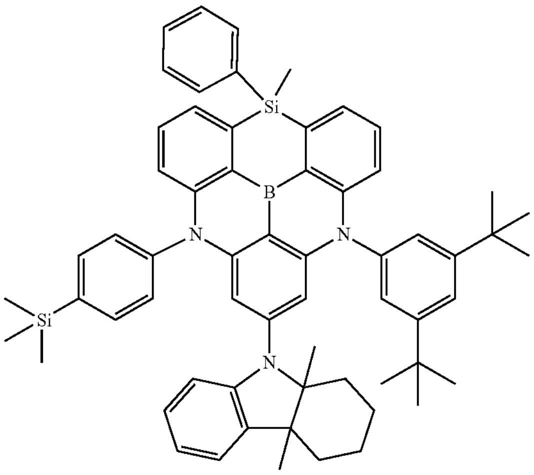
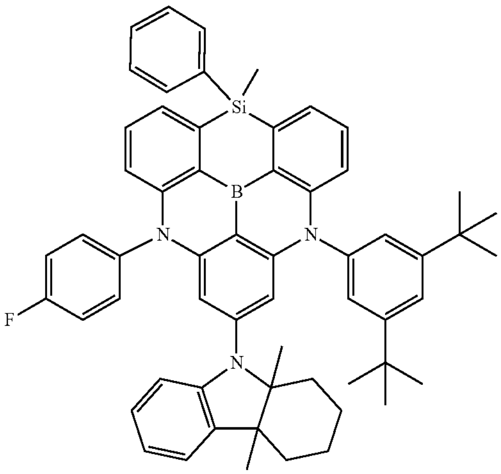

-continued
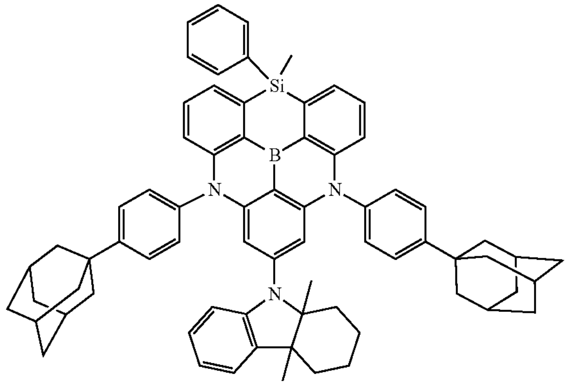
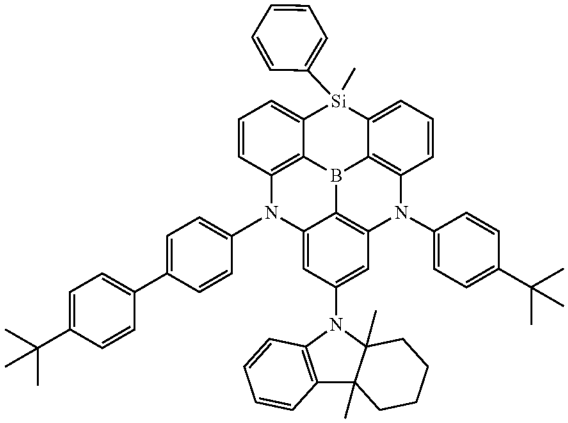
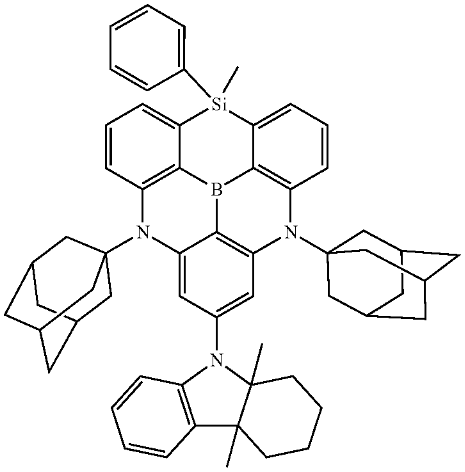
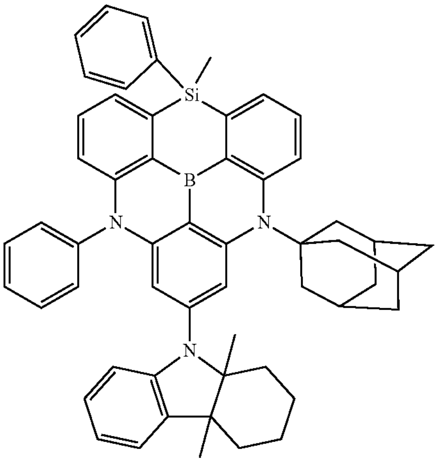
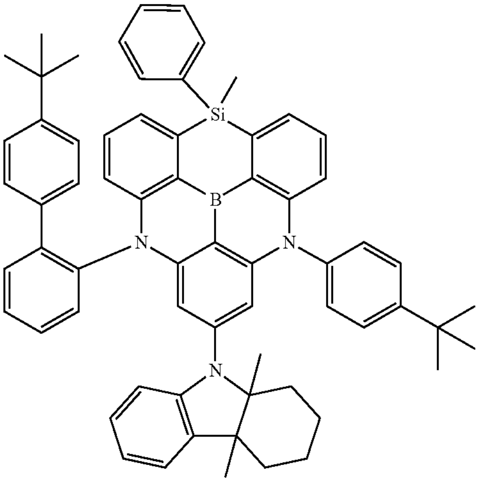
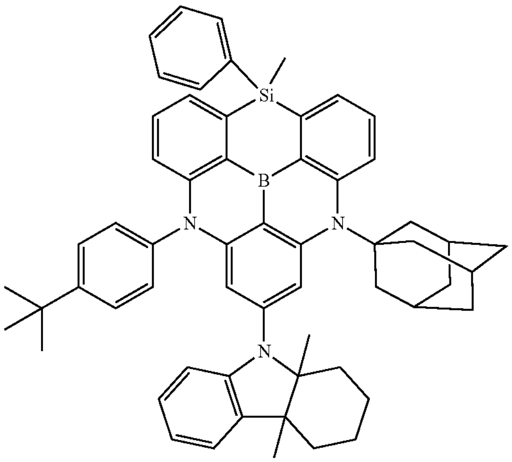

-continued
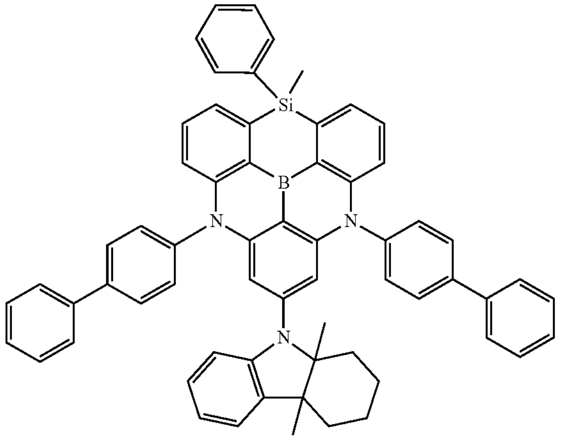
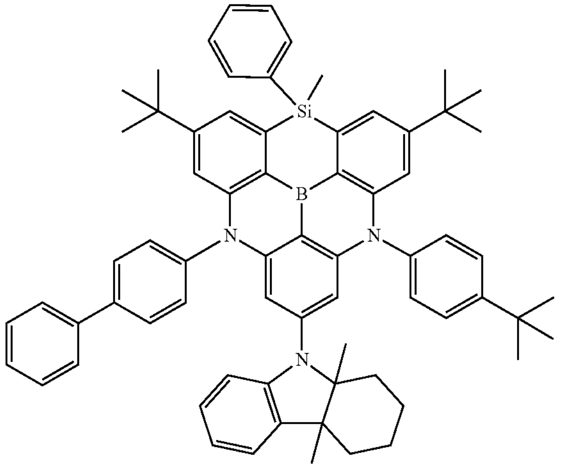
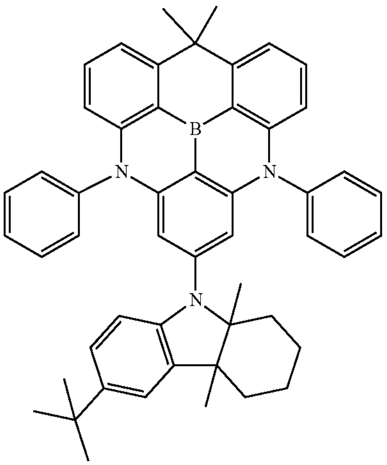
-continued
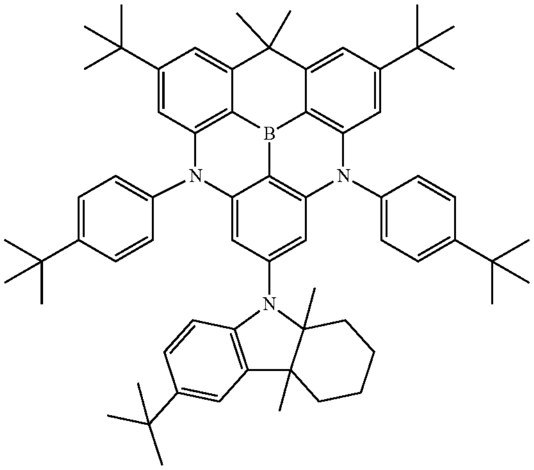
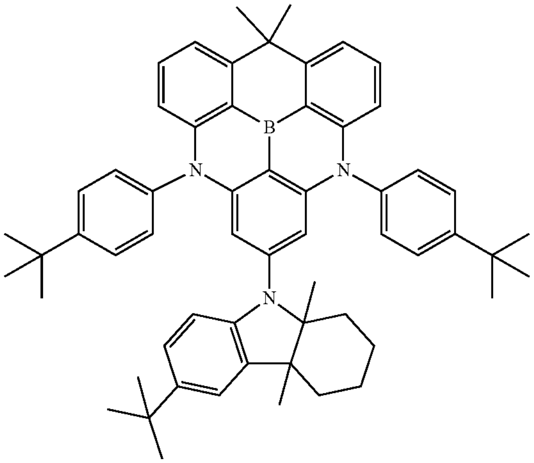
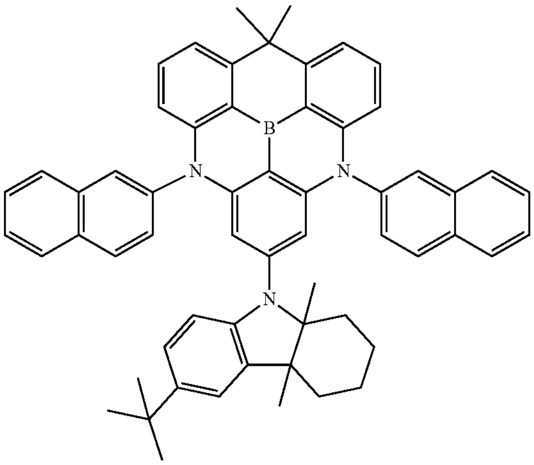

-continued
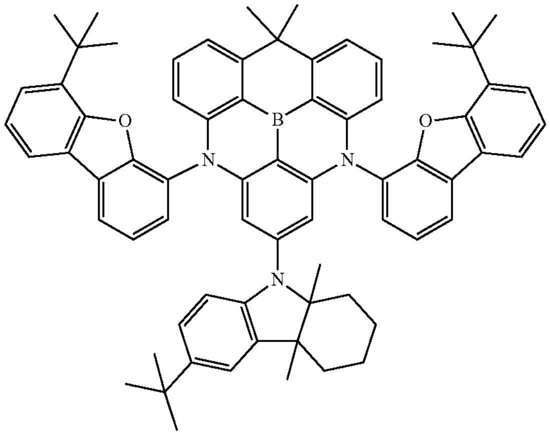
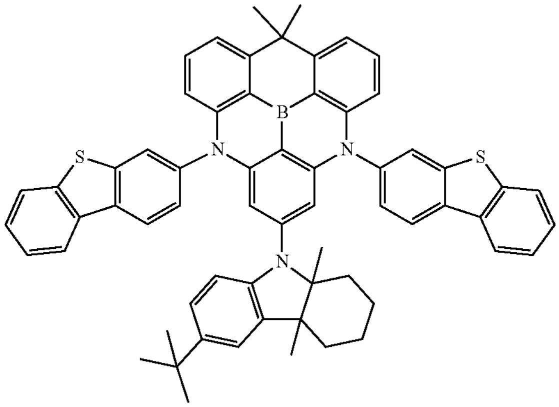
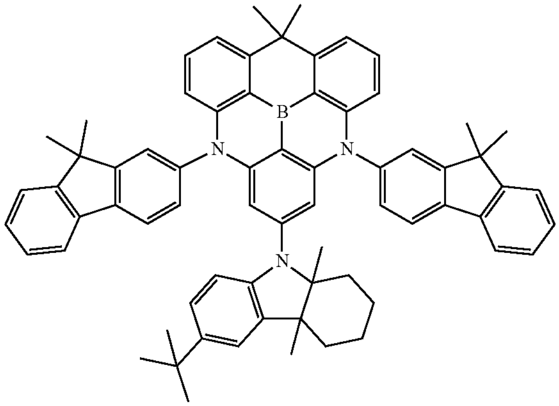
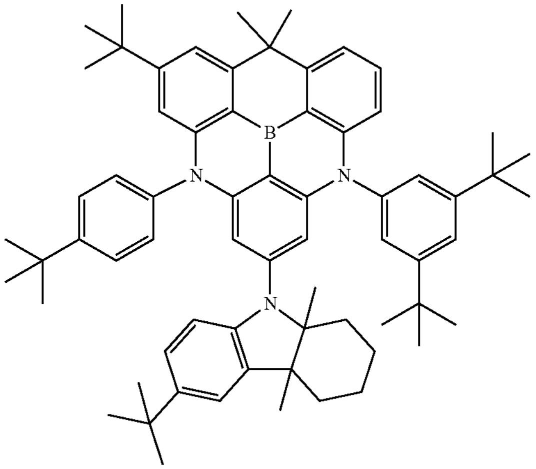
-continued
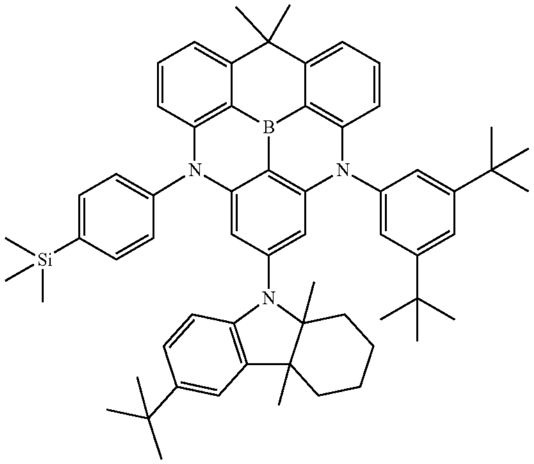
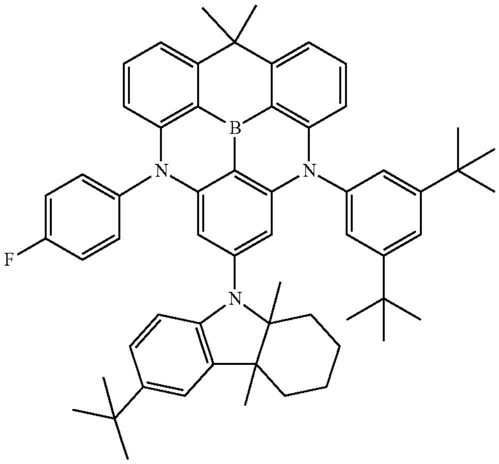
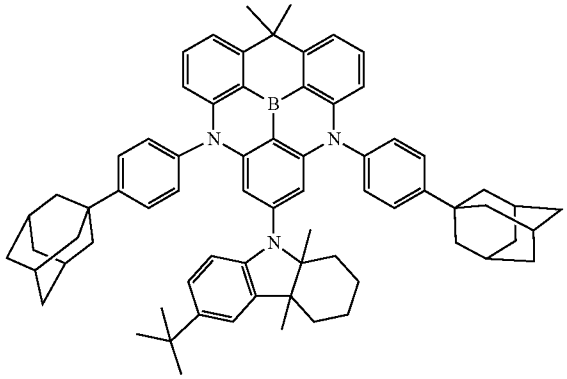

-continued
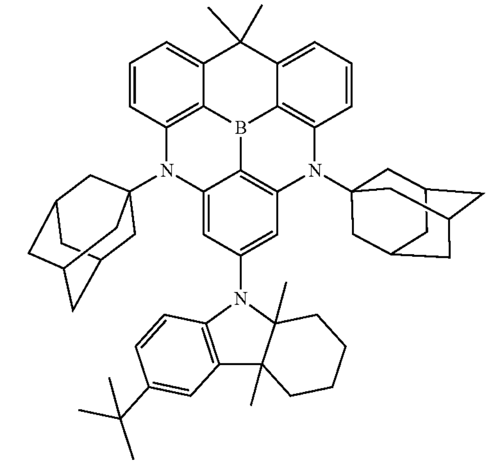
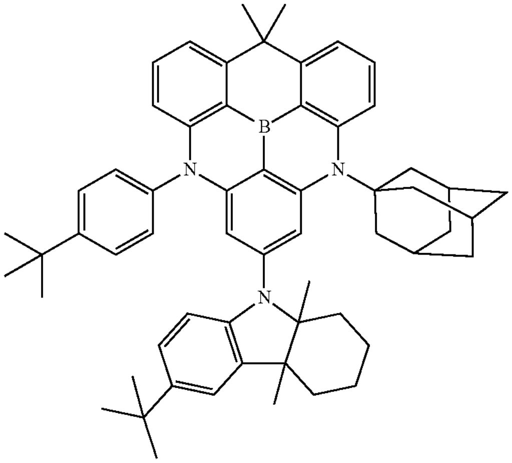
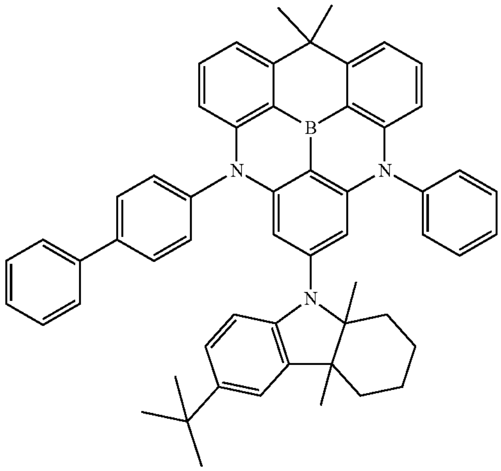
-continued
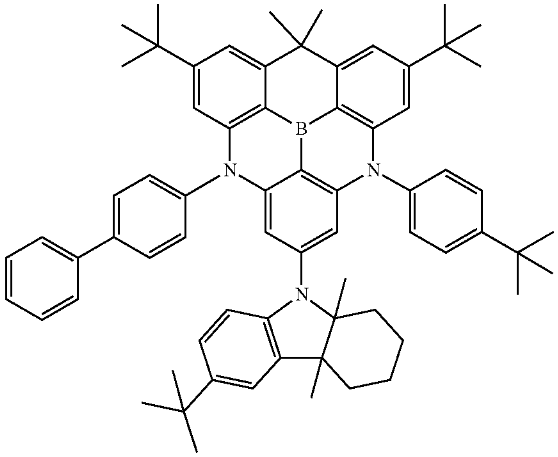
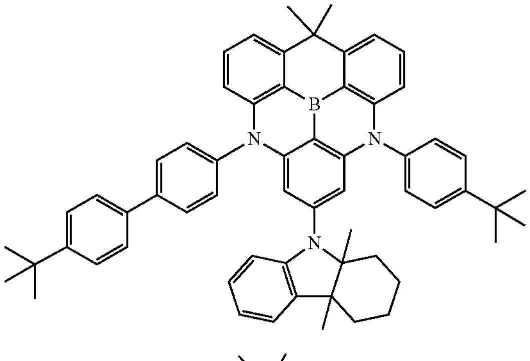
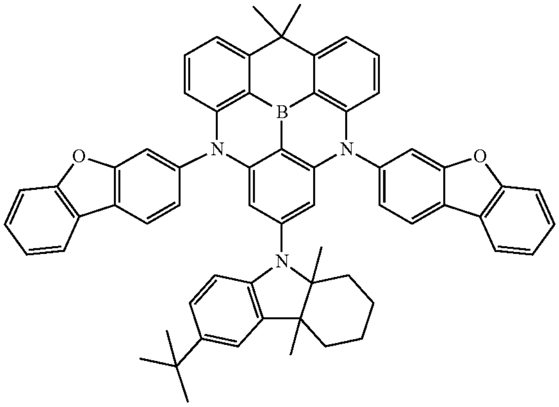
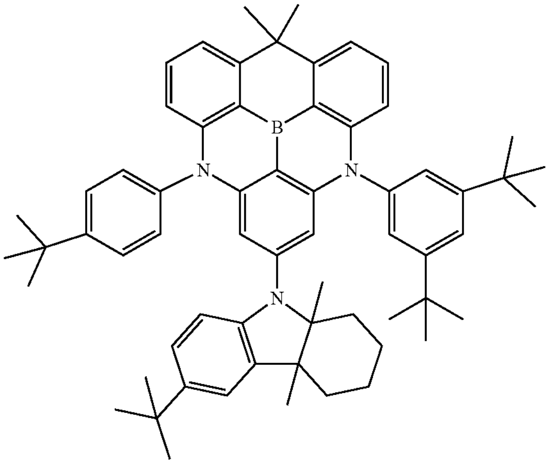

-continued
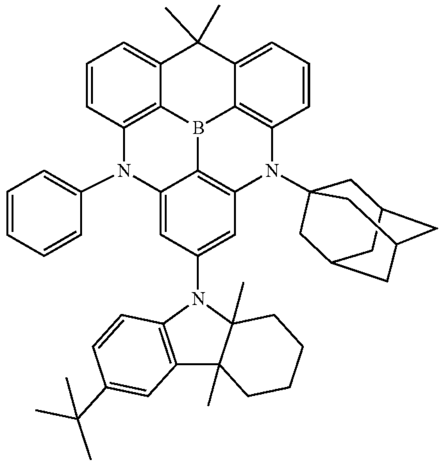
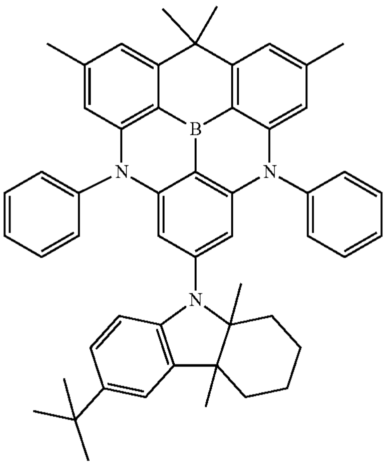
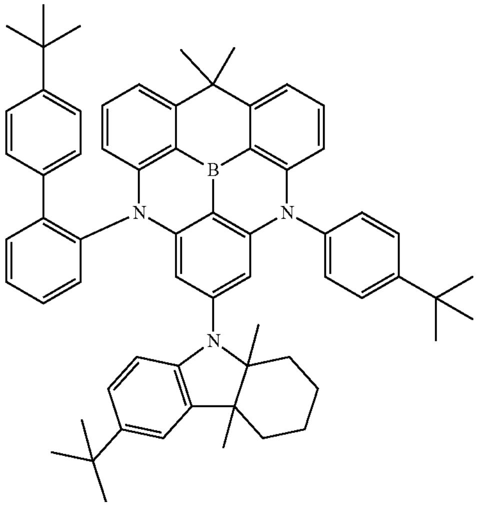
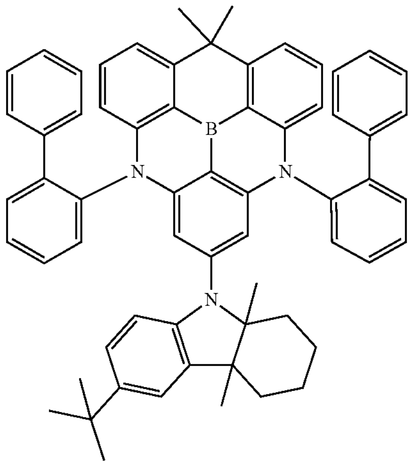
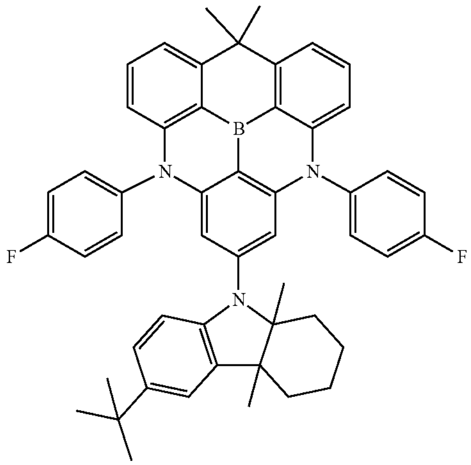
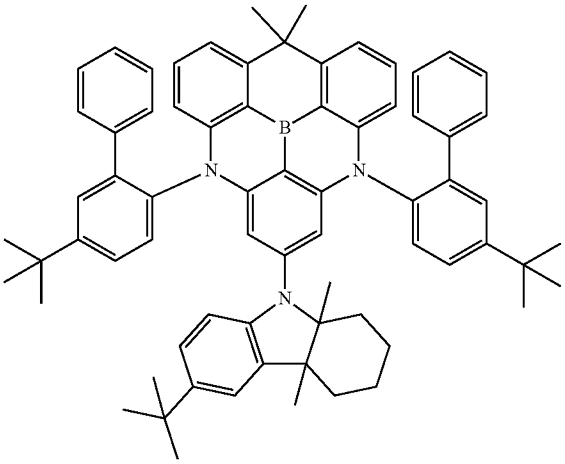

-continued
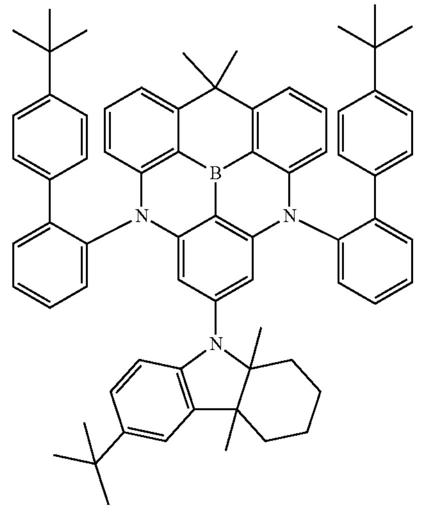
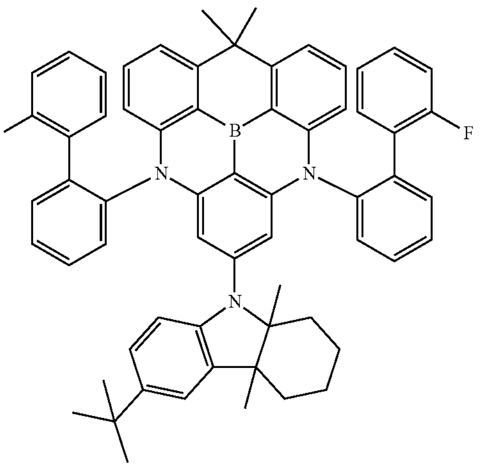
-continued
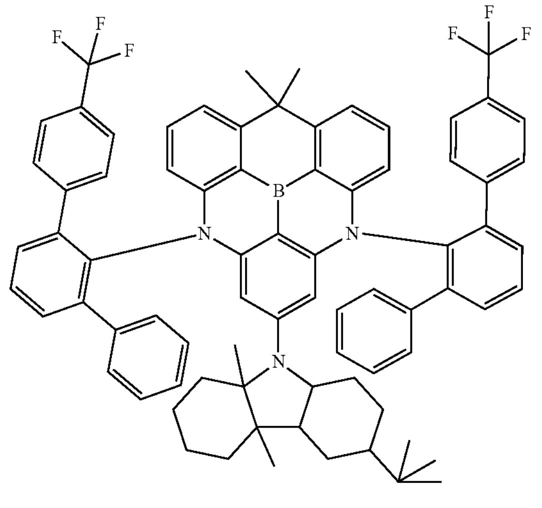
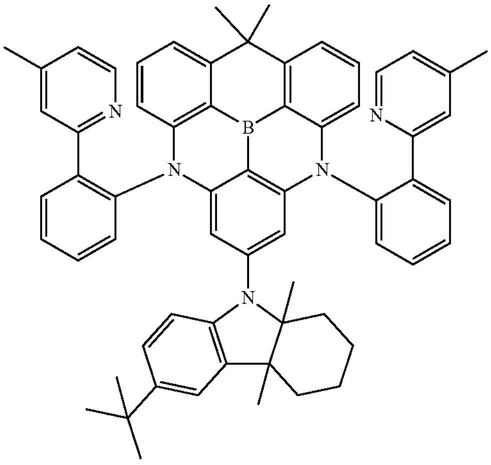
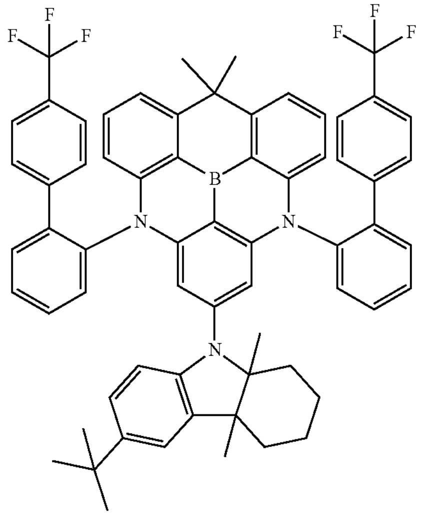
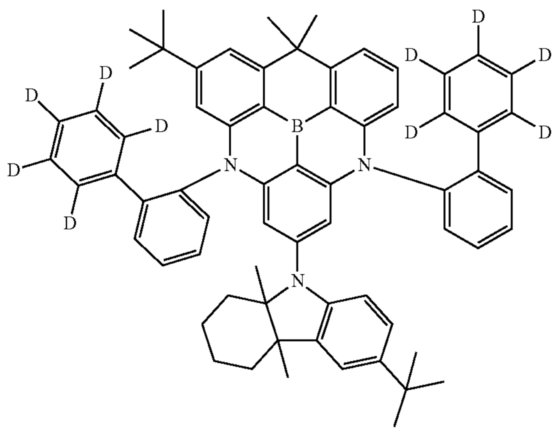

-continued
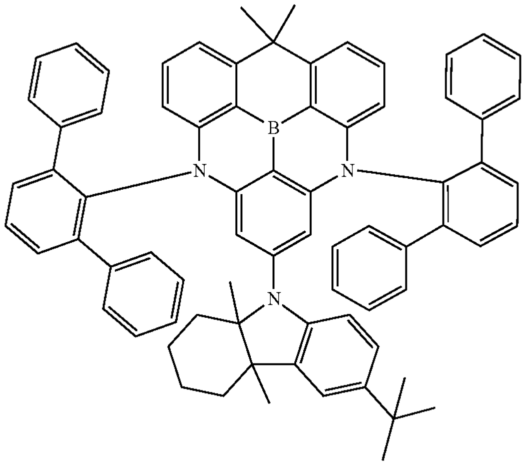
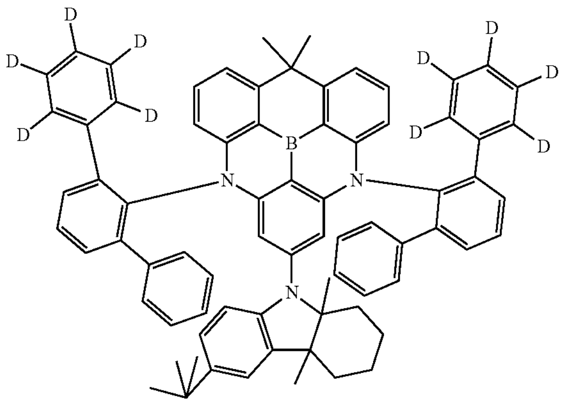
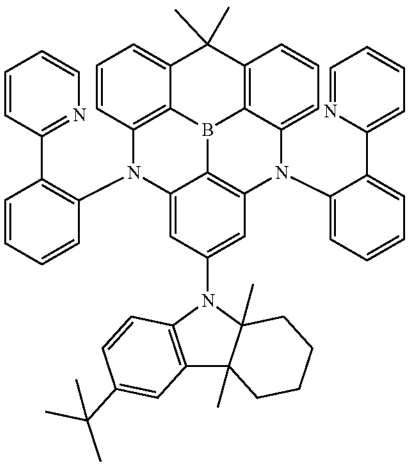
-continued
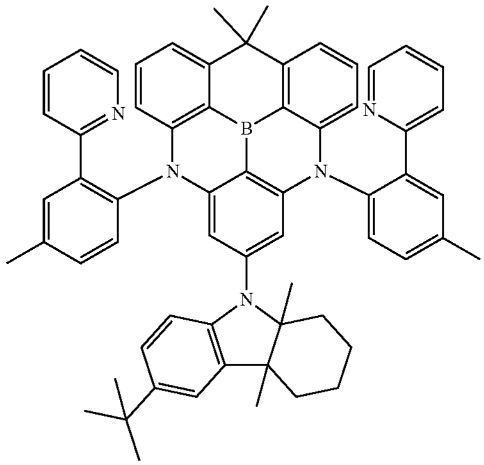
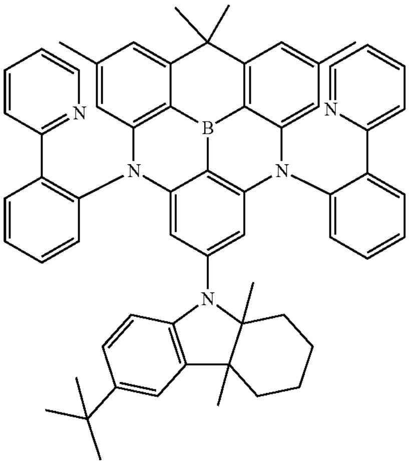
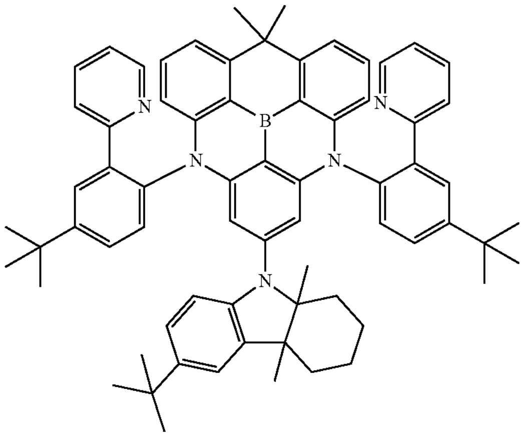

-continued
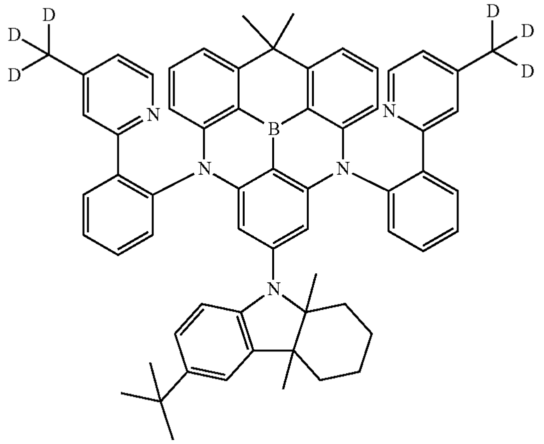
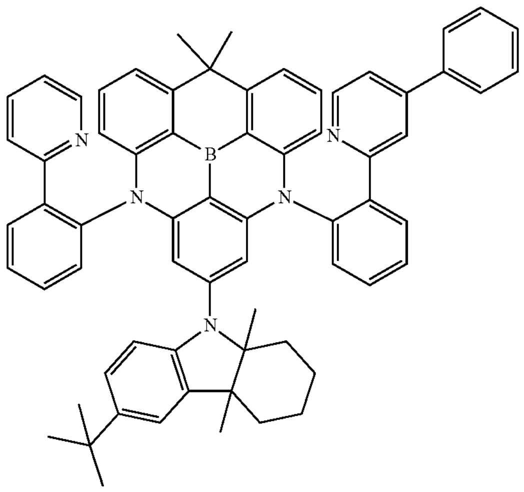
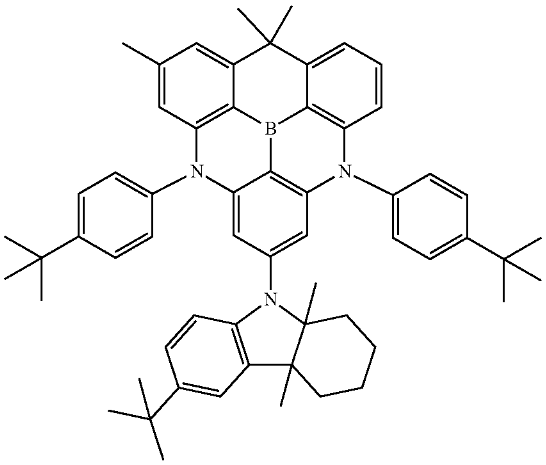
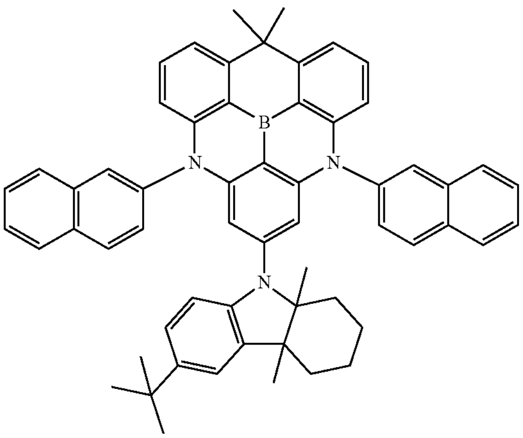
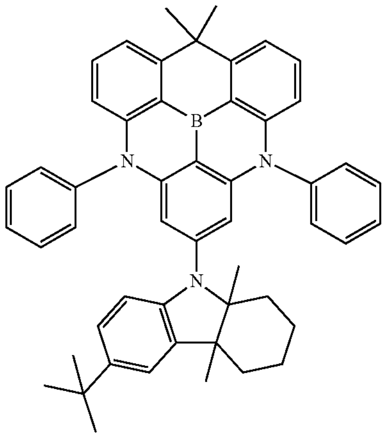
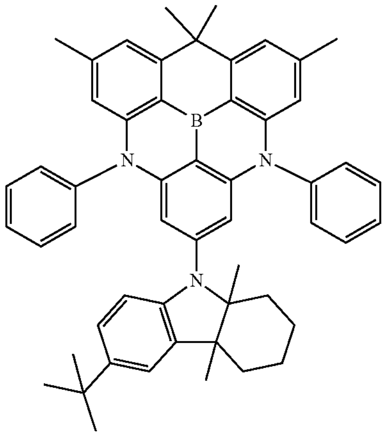
-continued -continued
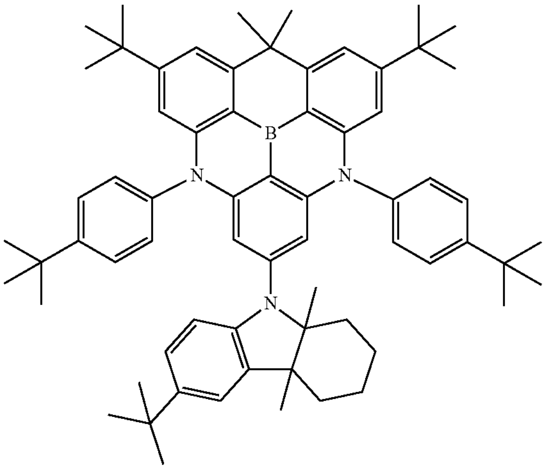
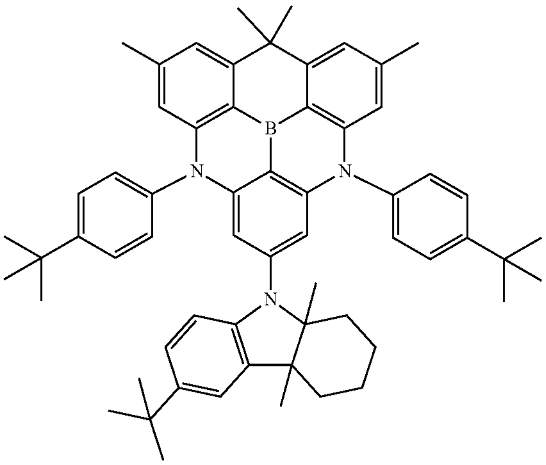
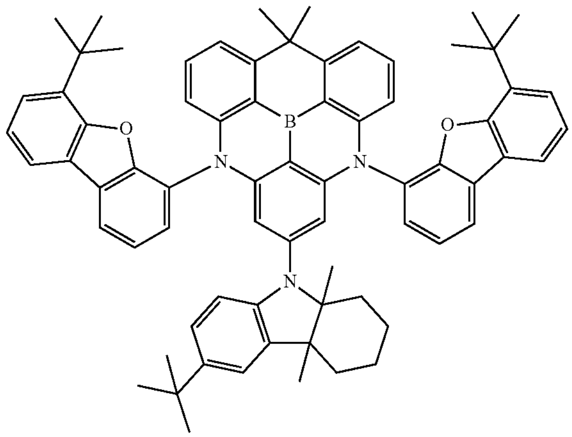
-continued
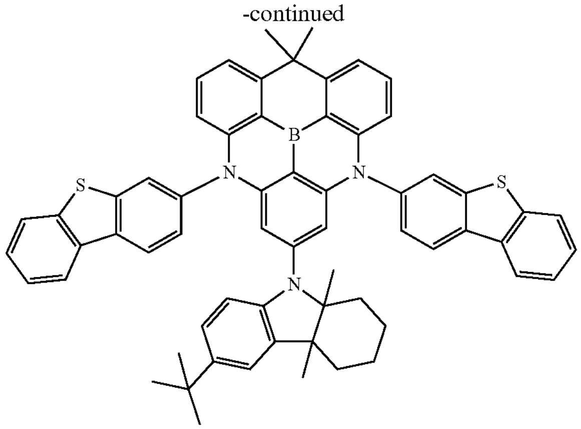
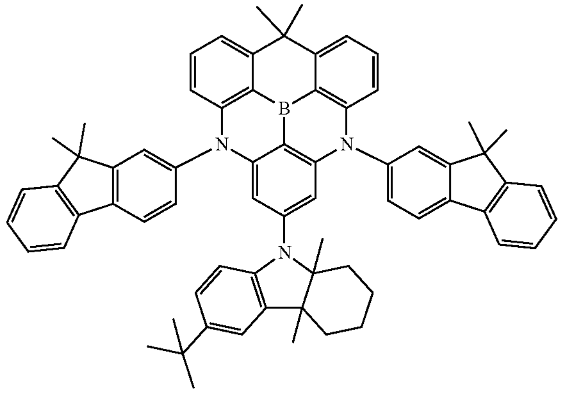
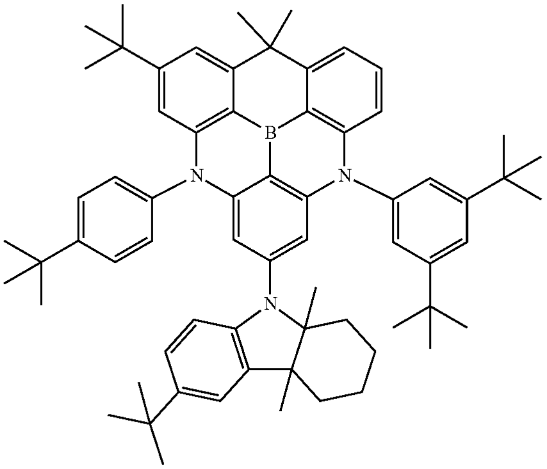
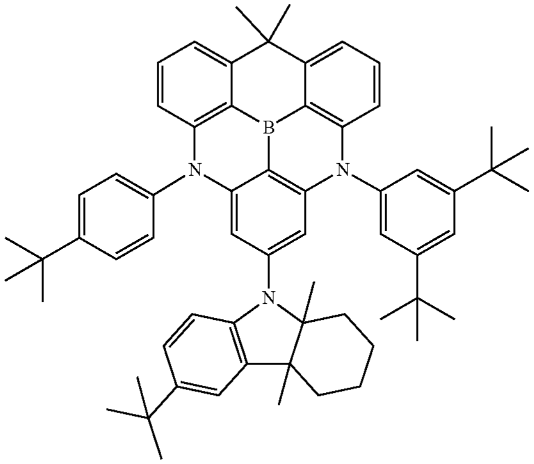

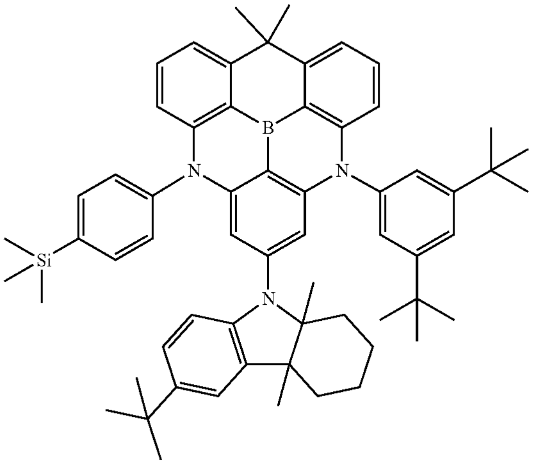
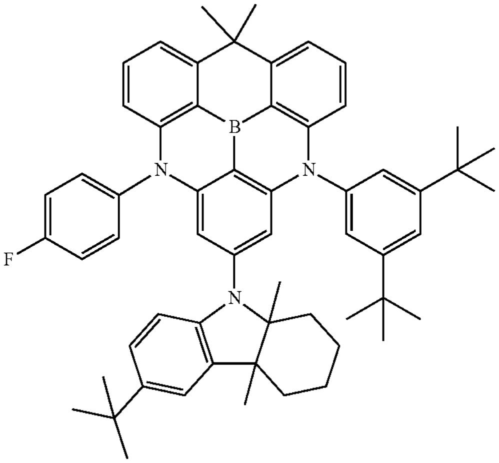
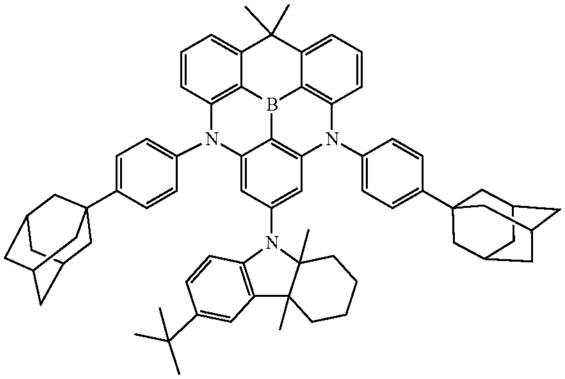
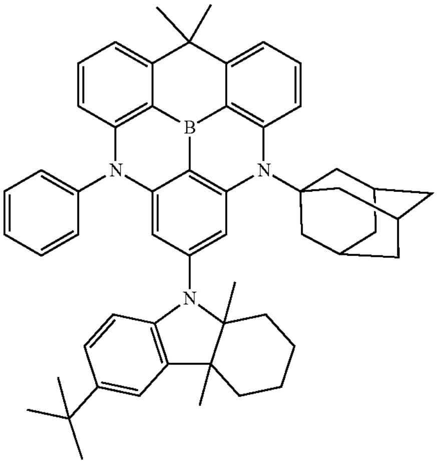
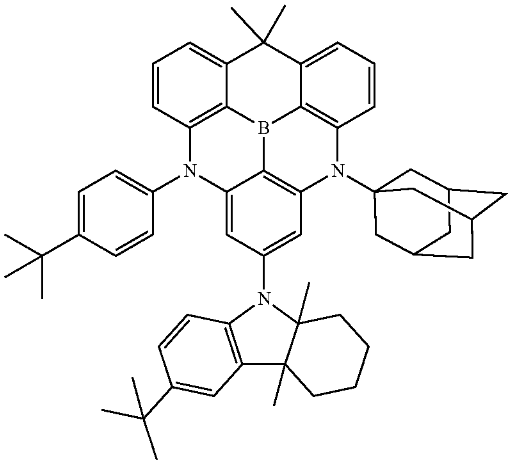
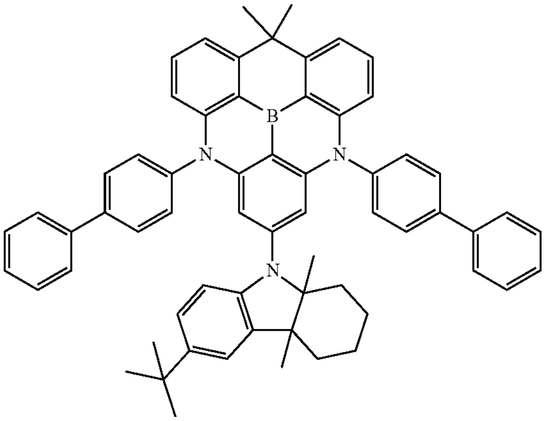

-continued
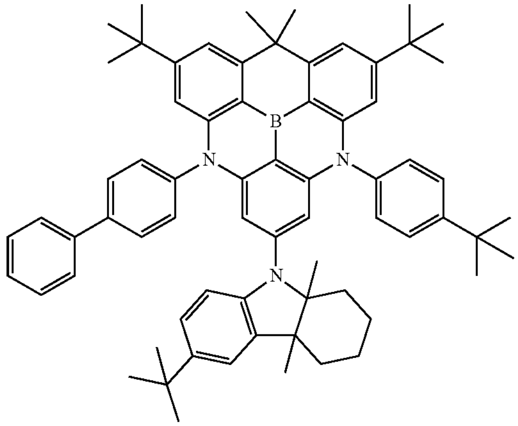
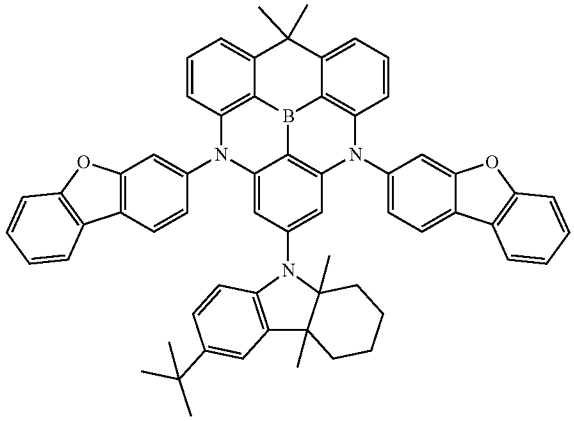
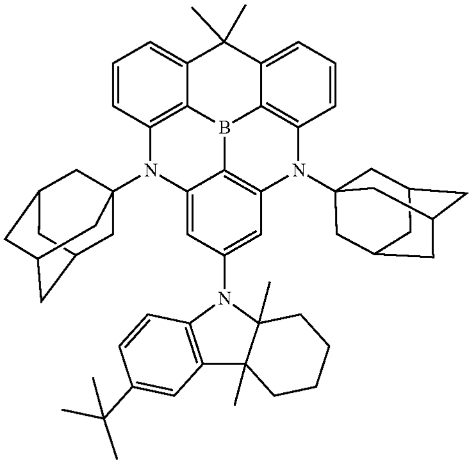
-continued
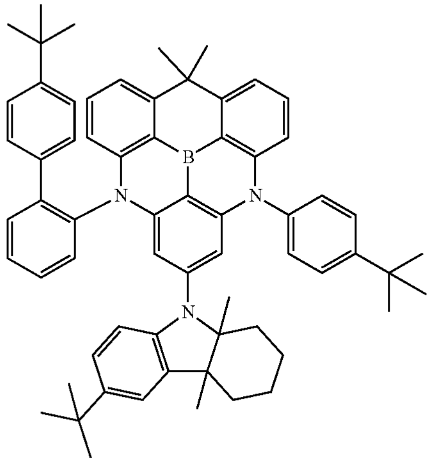
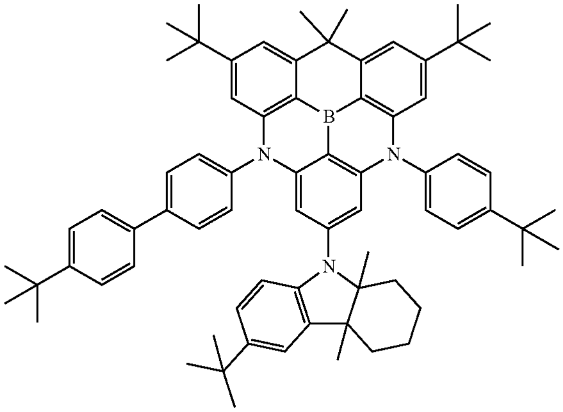
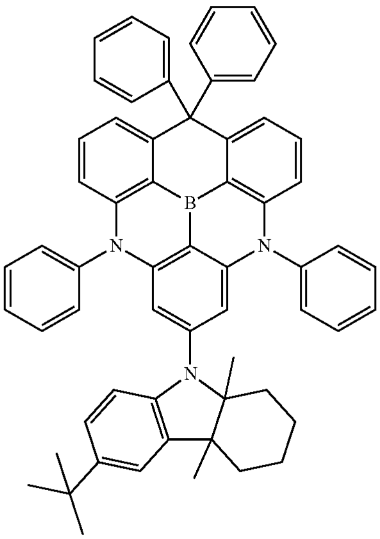

-continued
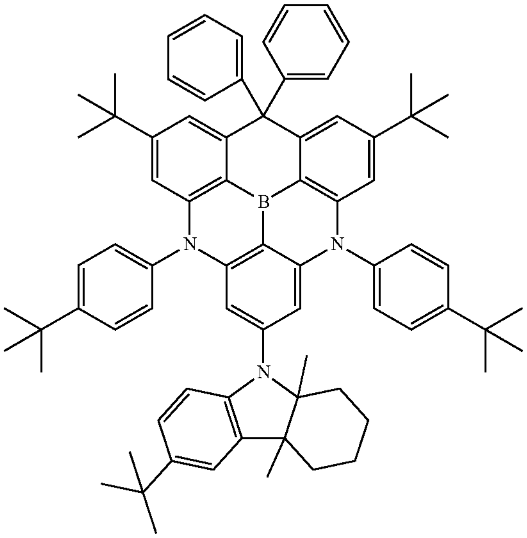
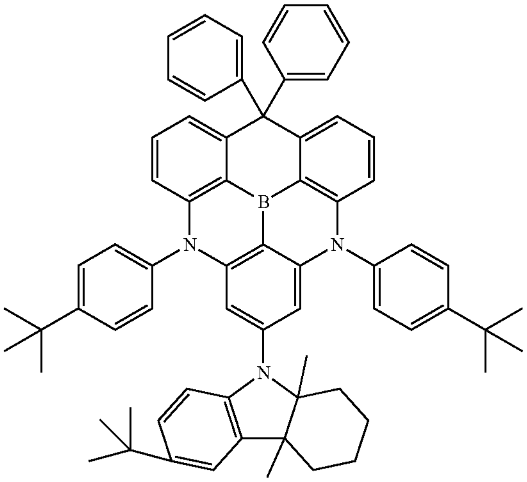
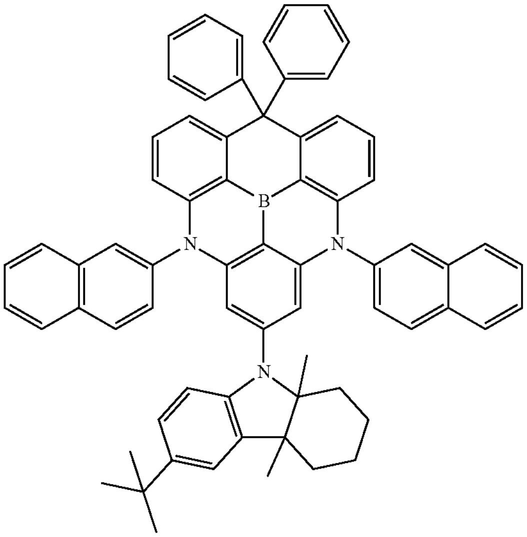
-continued
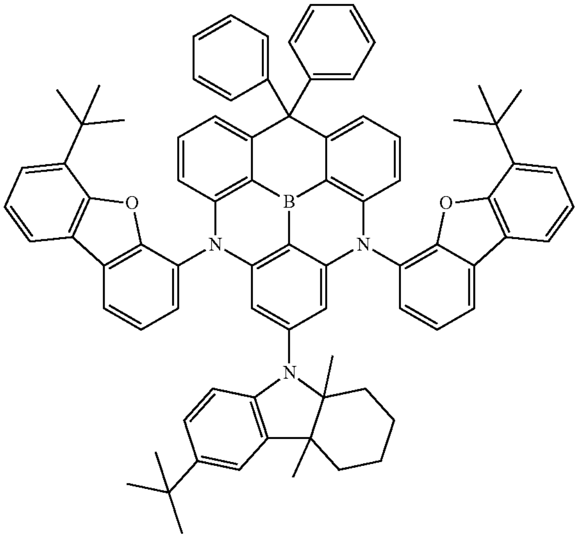
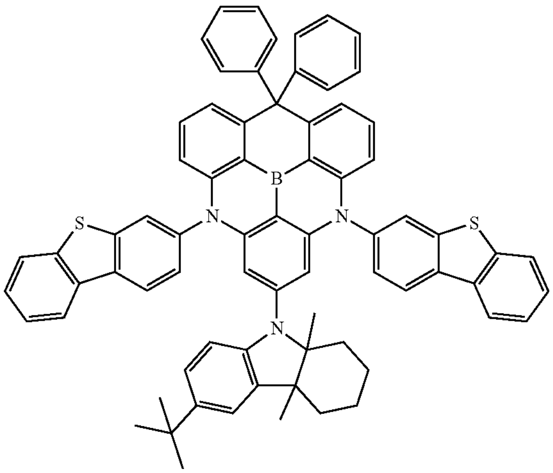
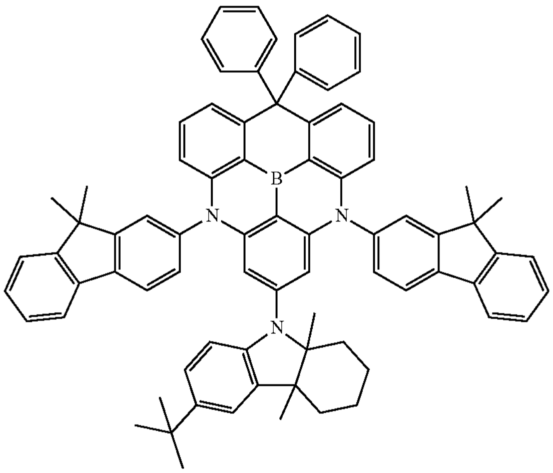

-continued
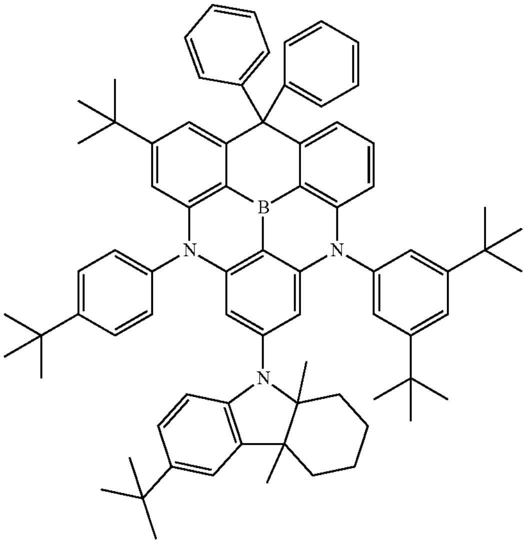
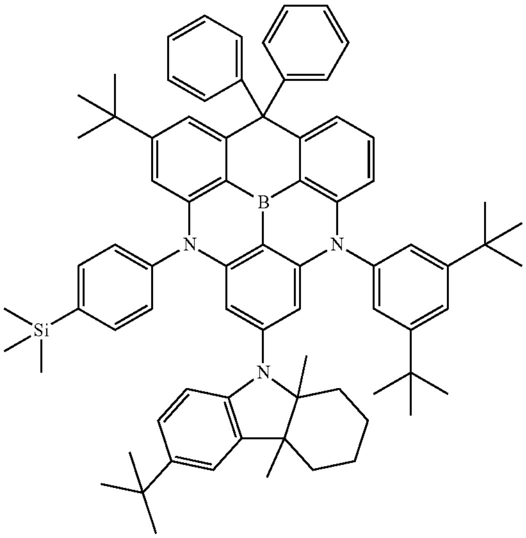
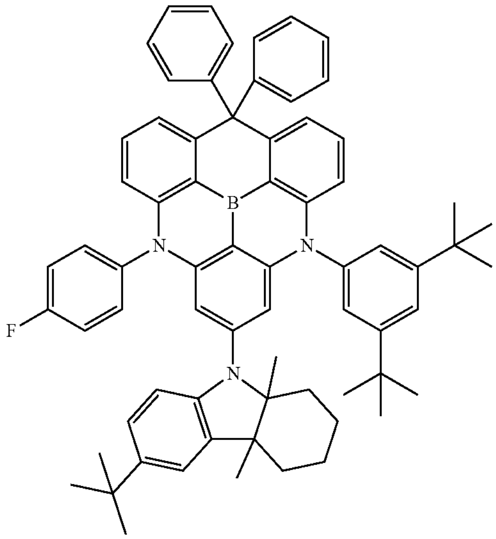
-continued
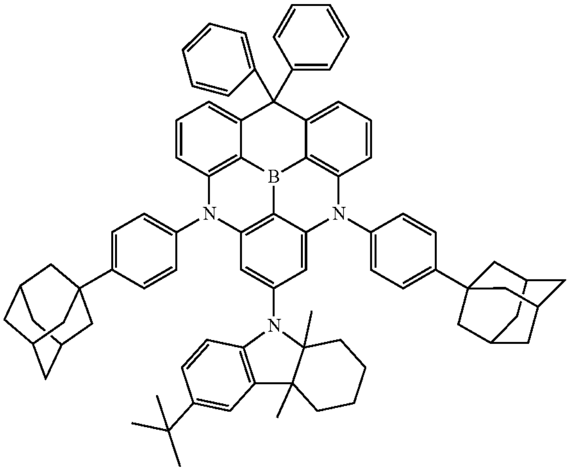
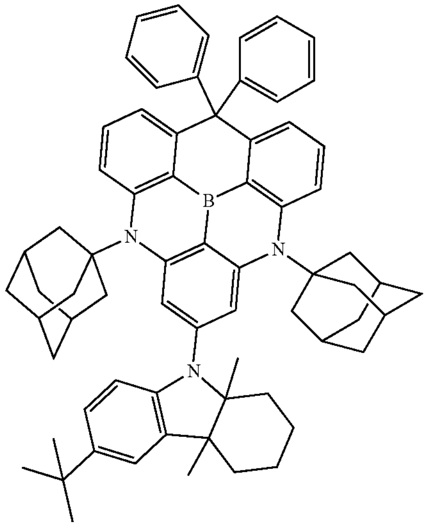
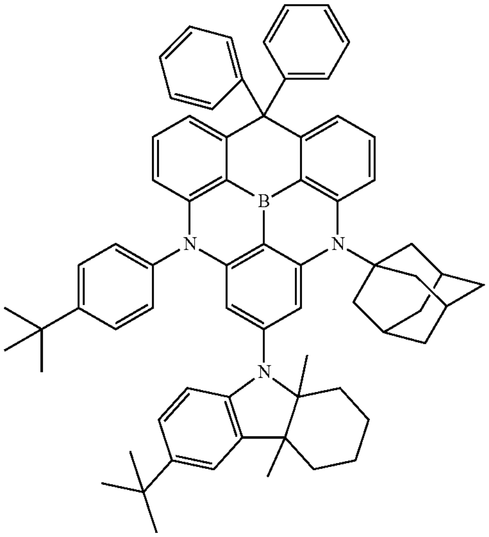

-continued
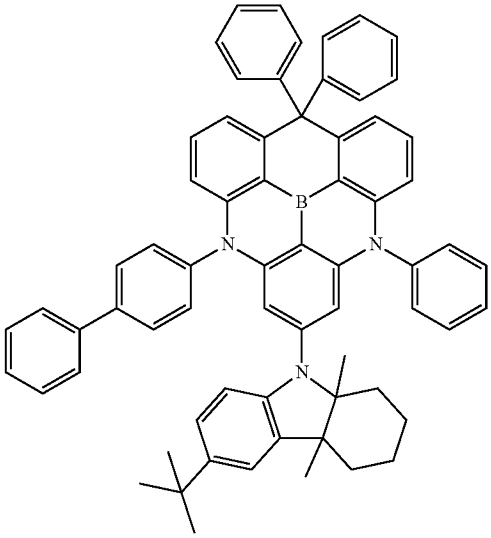
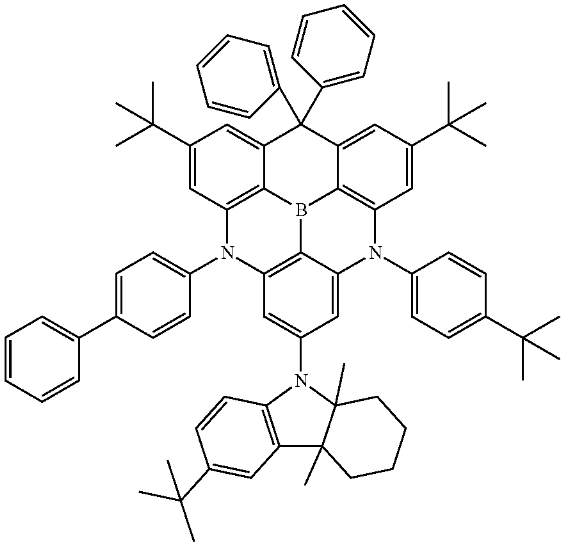
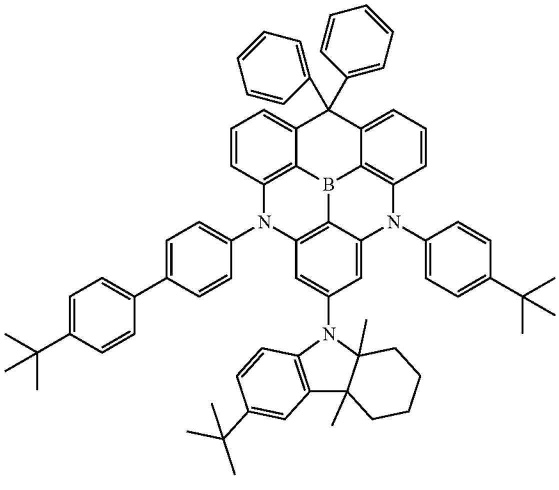
-continued
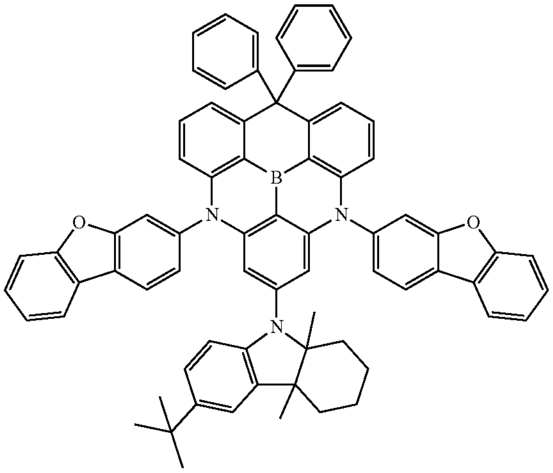
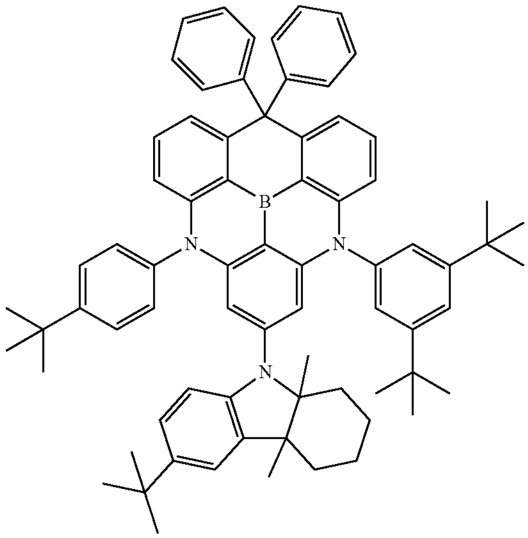
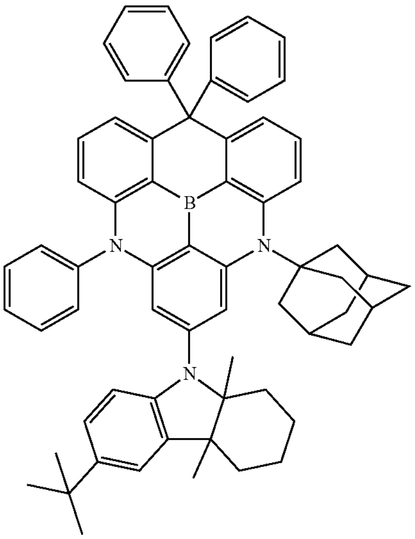

-continued
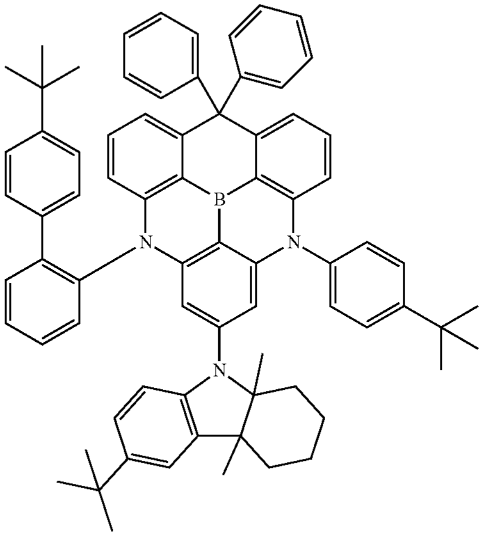
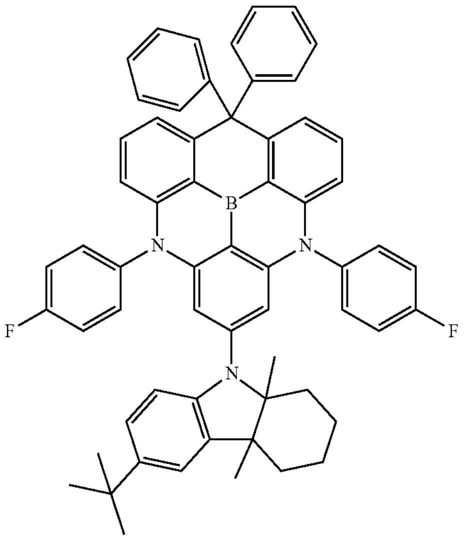
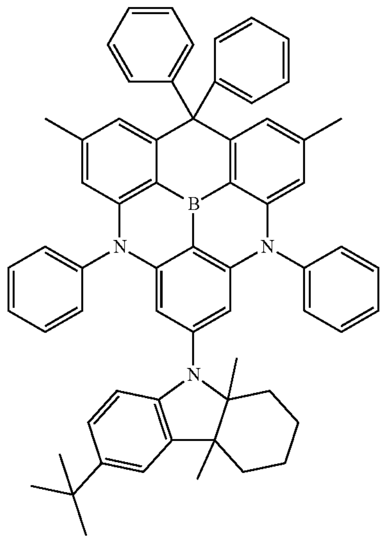
-continued
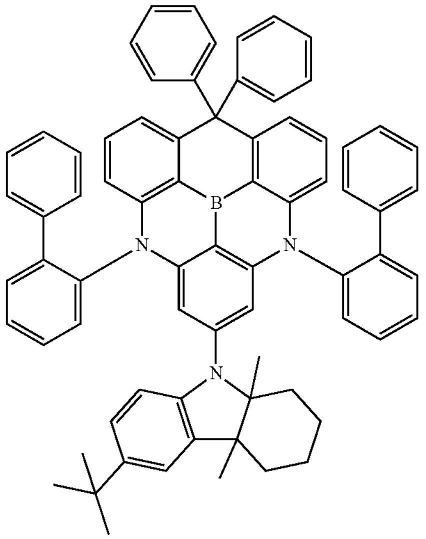
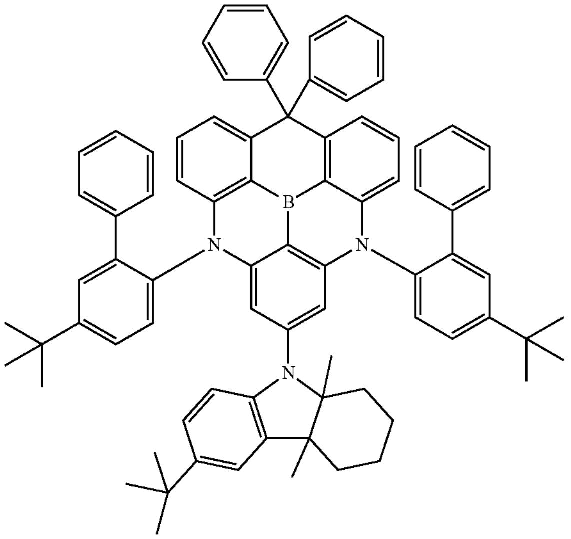
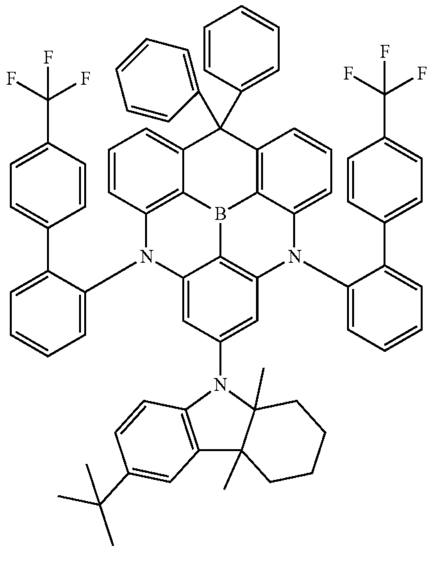

-continued
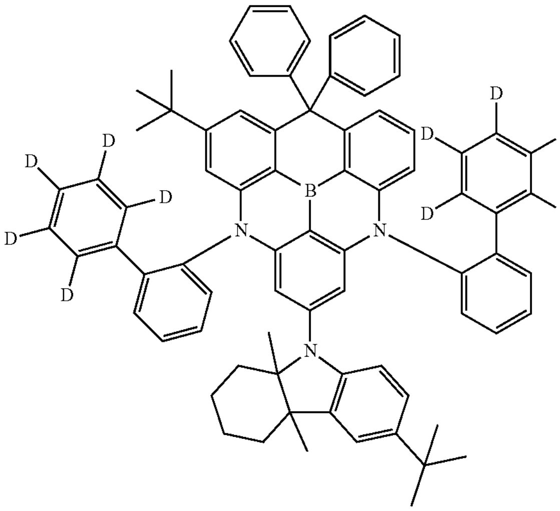
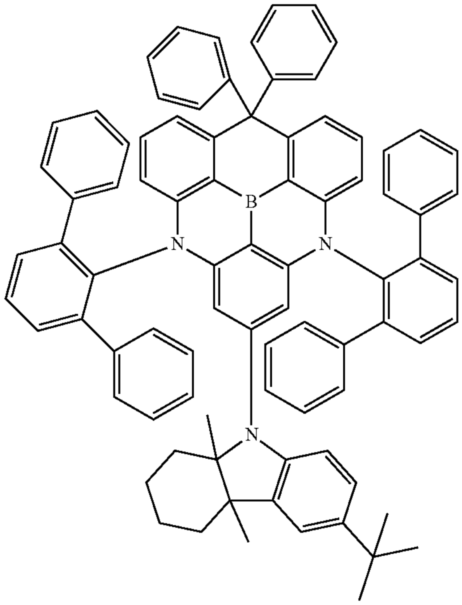
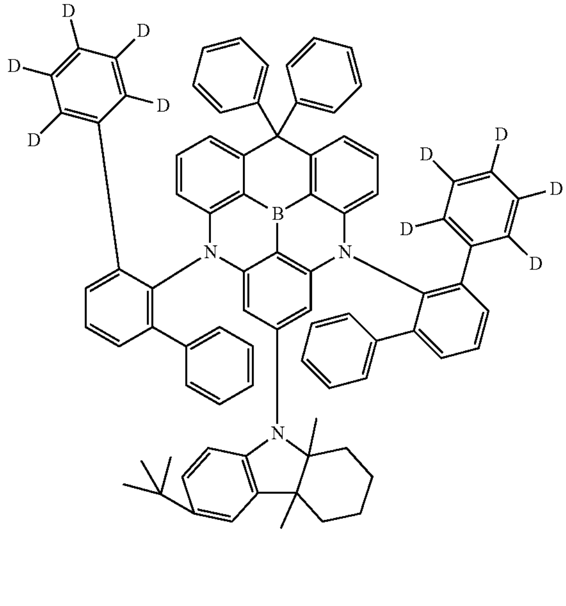
-continued
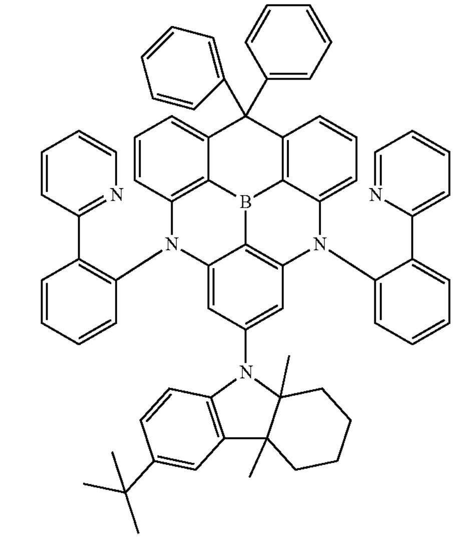
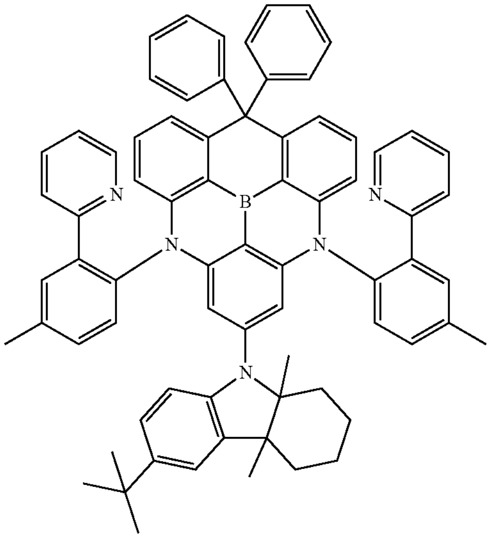
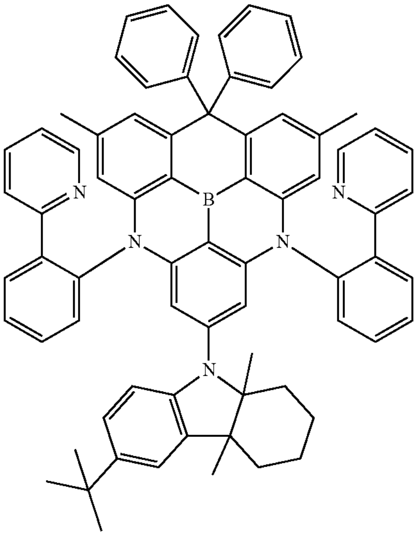

-continued
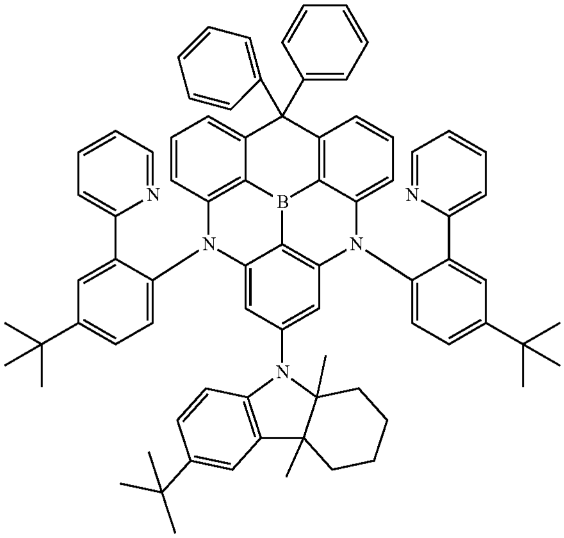
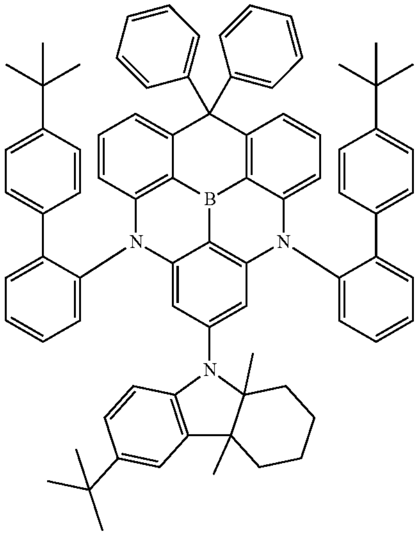
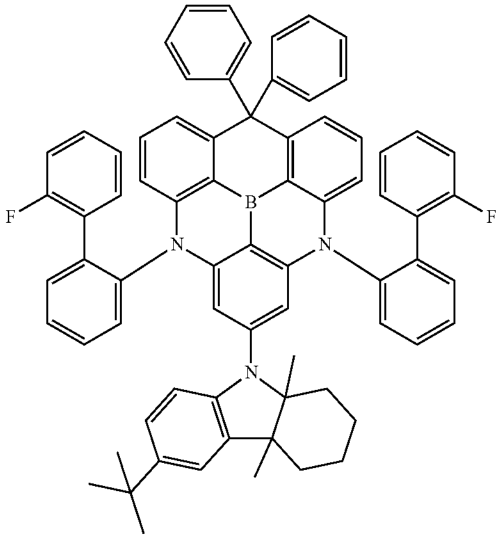
-continued
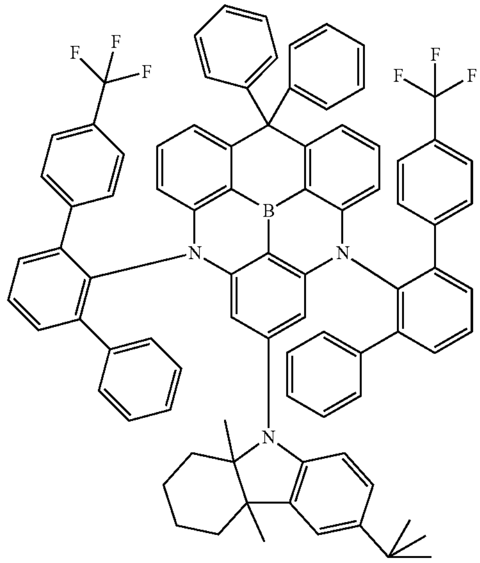
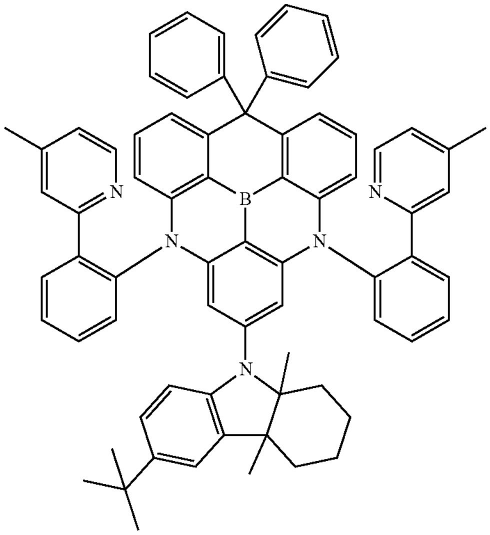
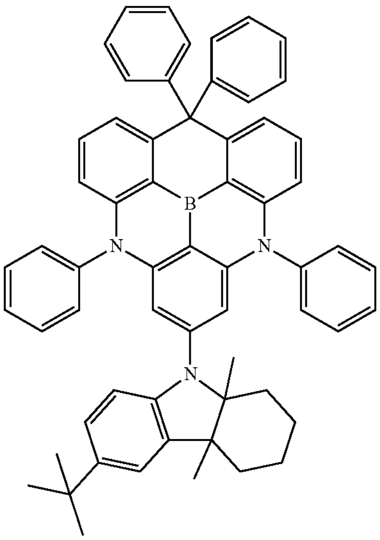

-continued
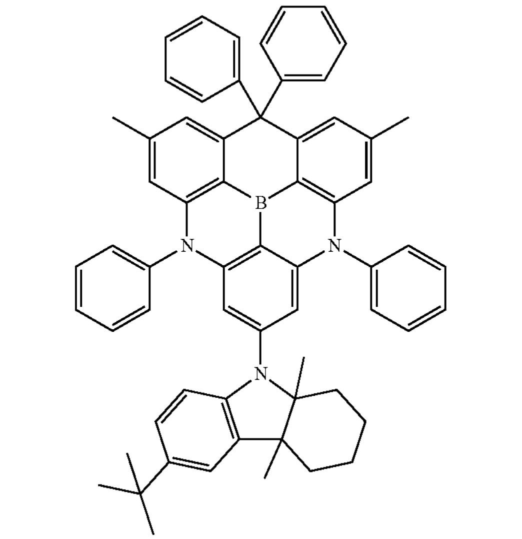
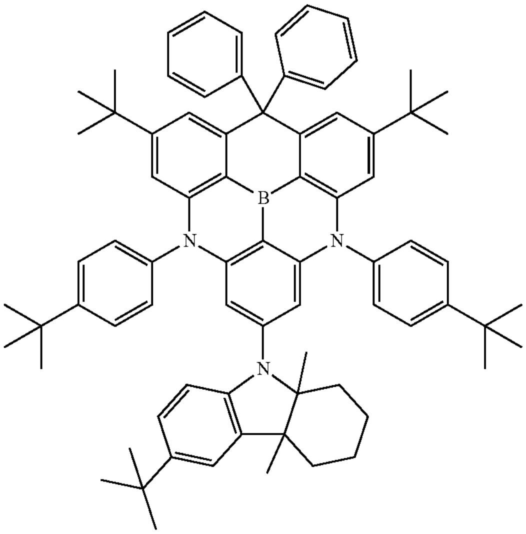
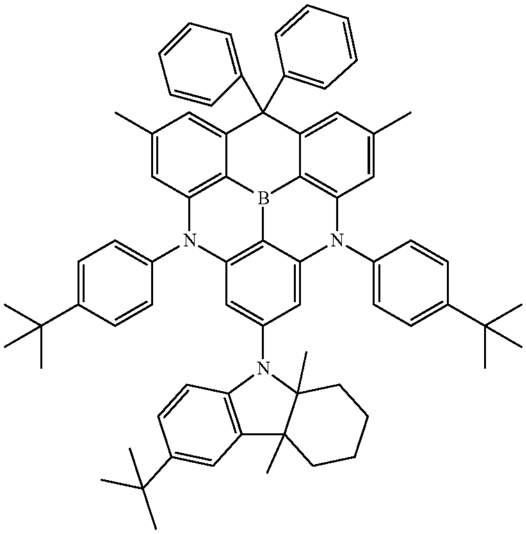
-continued
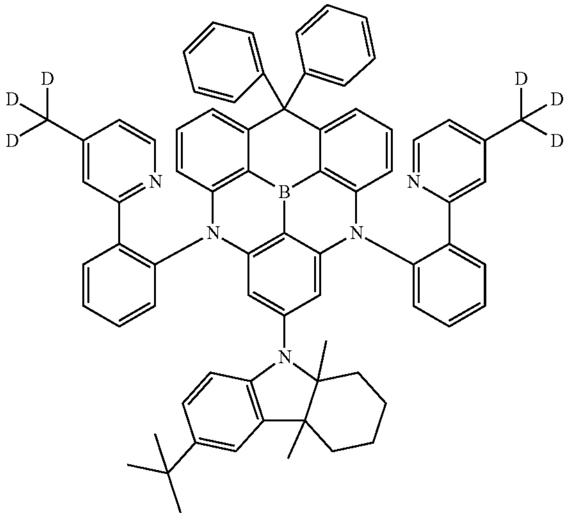
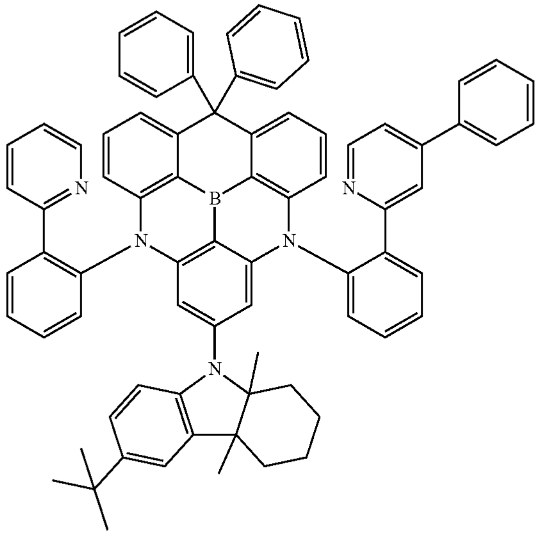
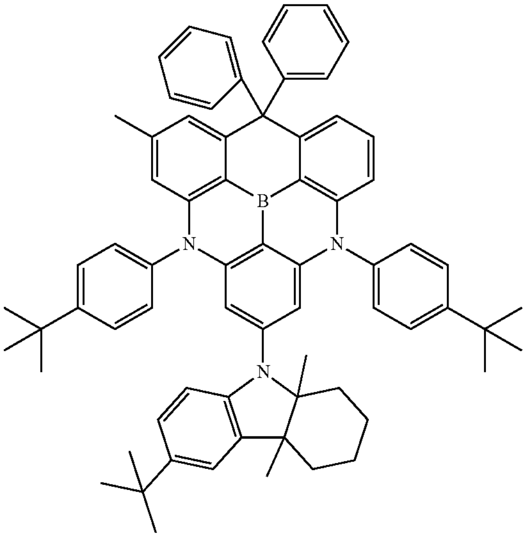

-continued
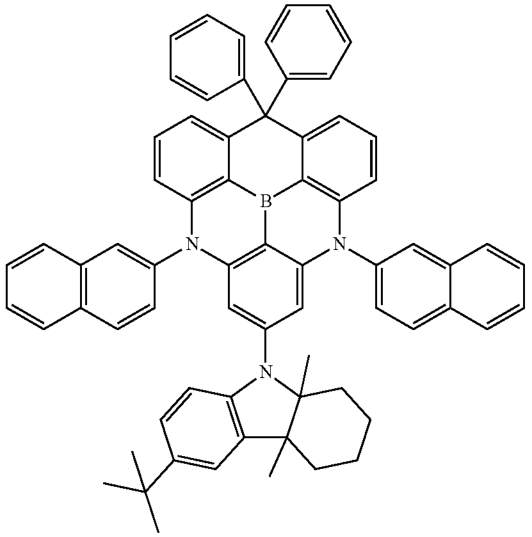
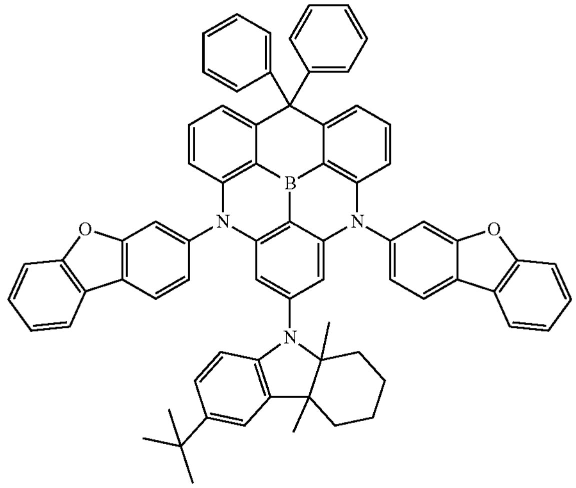
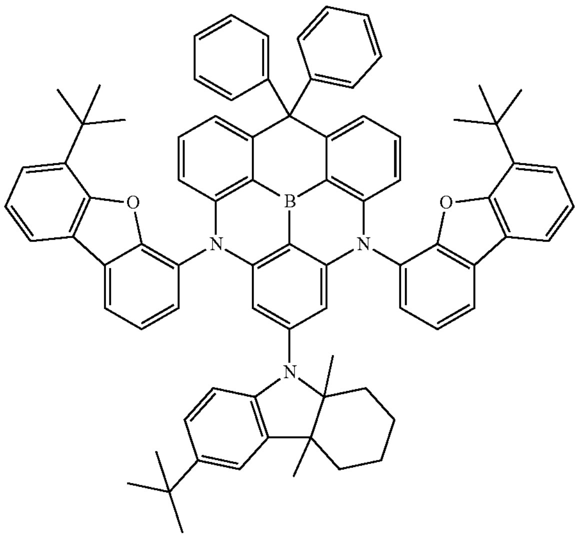
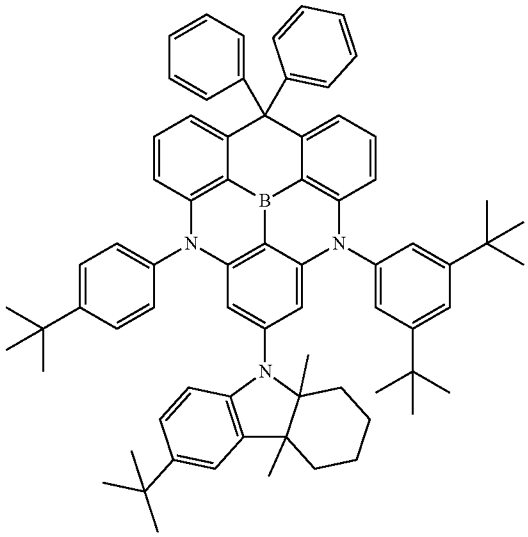
-continued
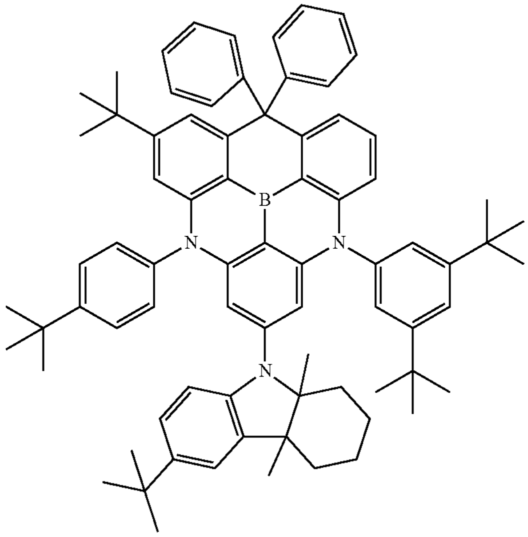
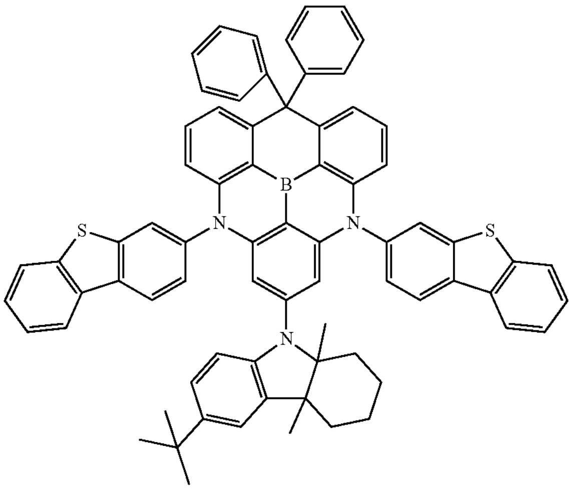

-continued
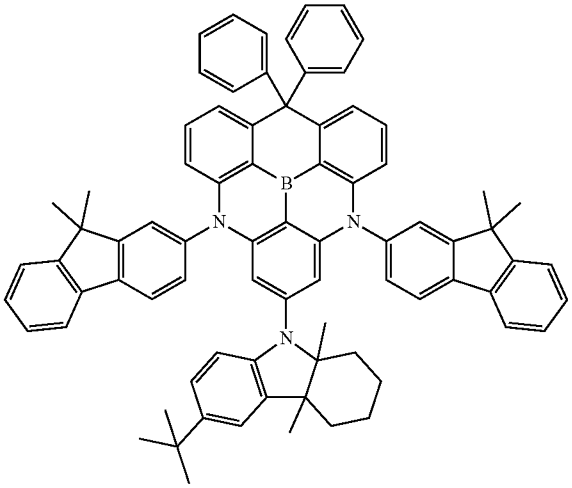
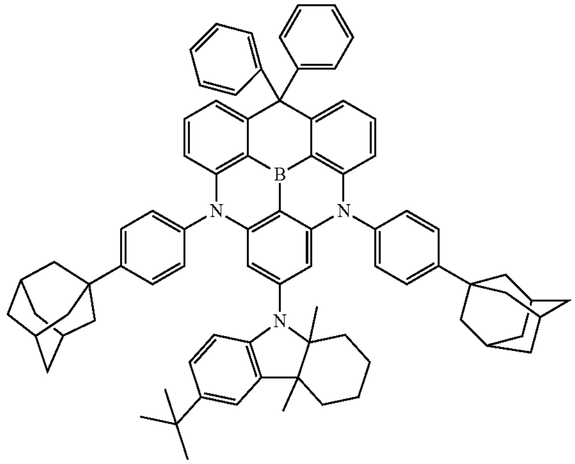
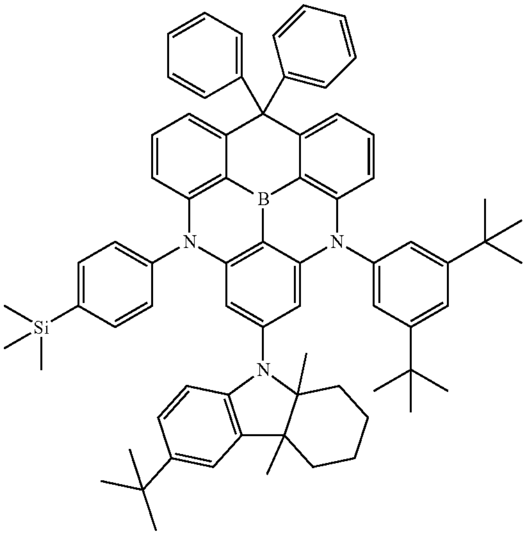
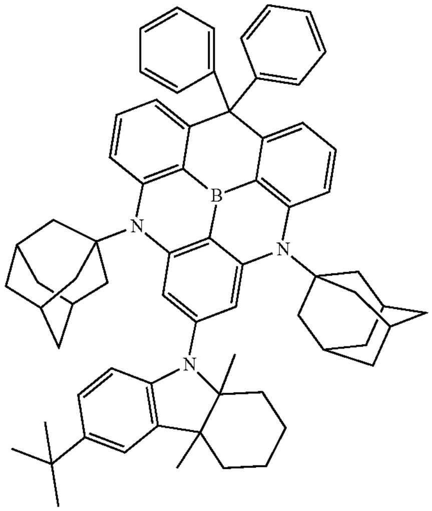
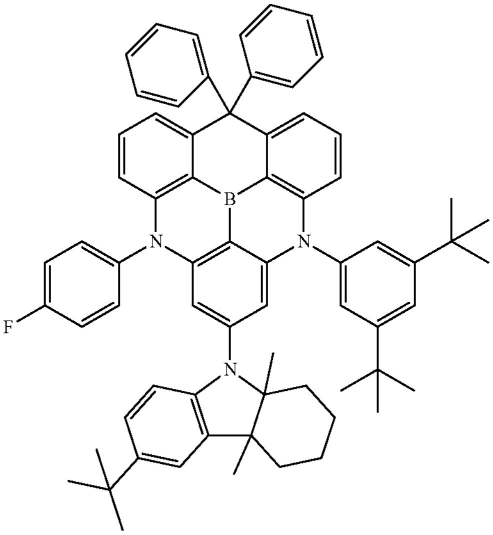
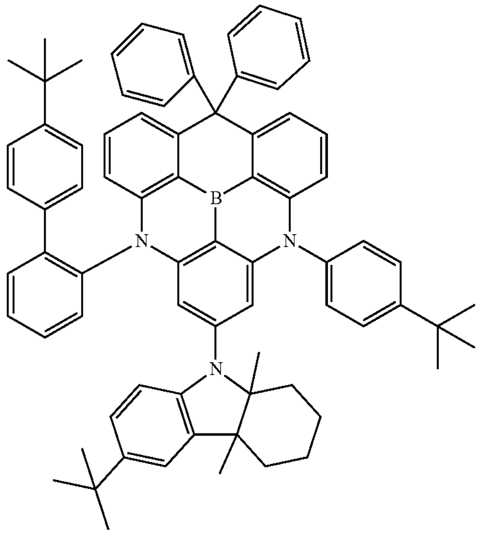
-continued -continued
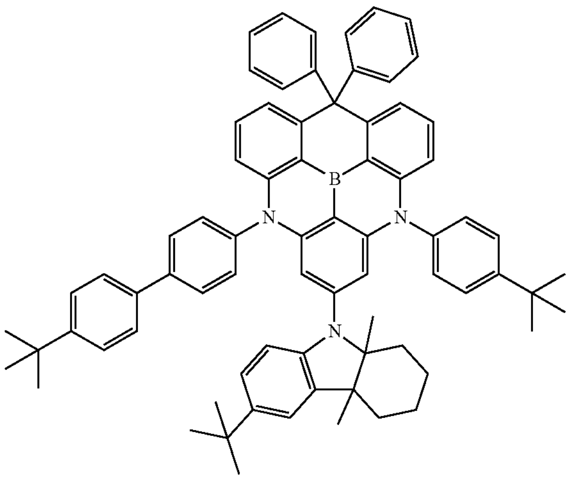
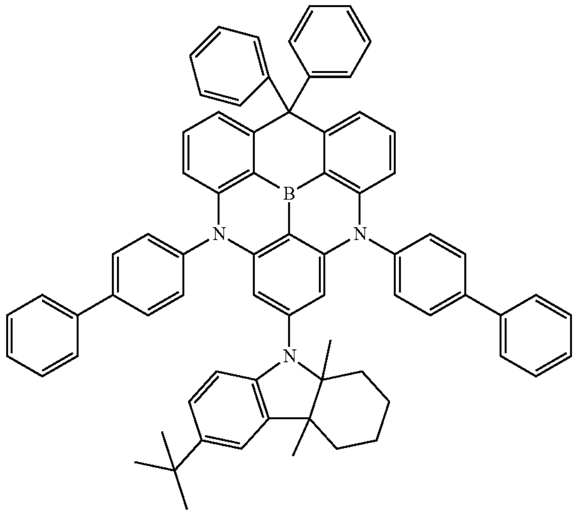
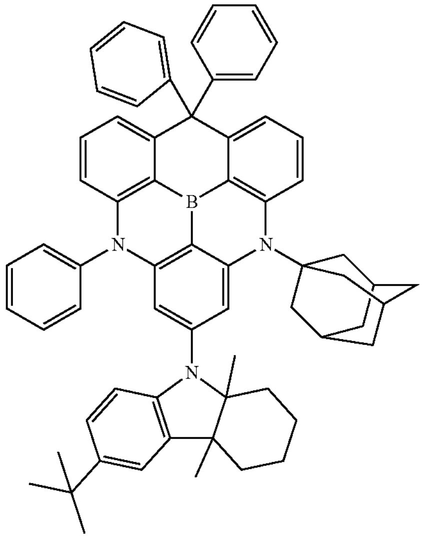
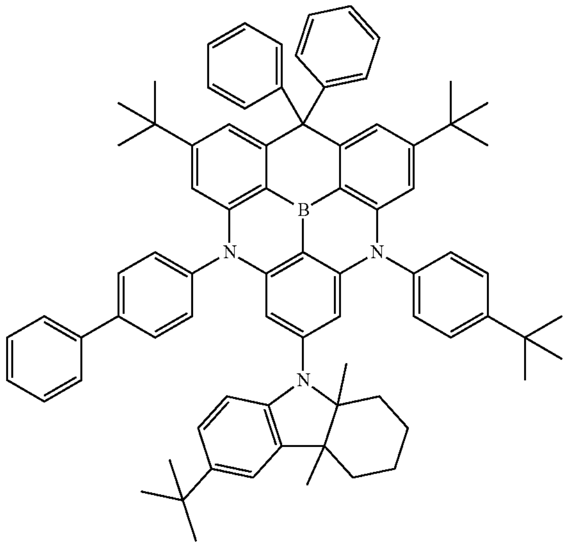
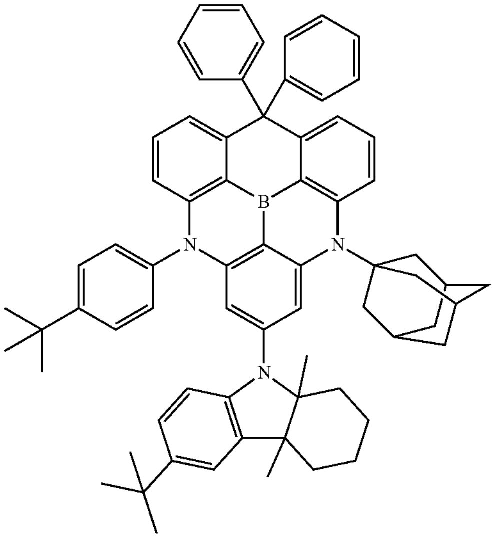
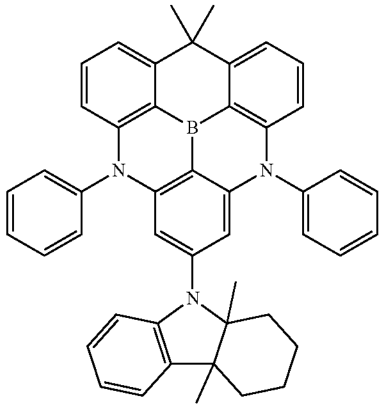

-continued
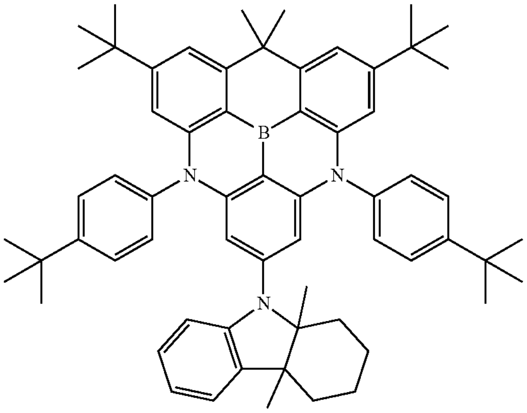
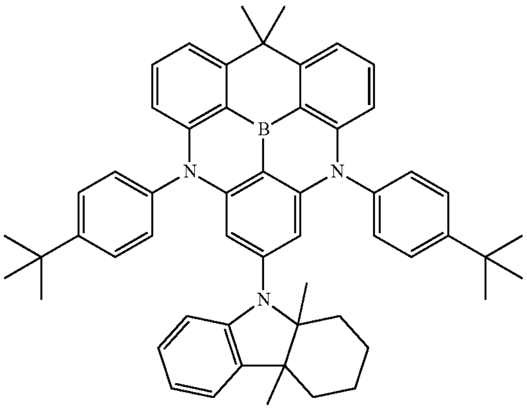
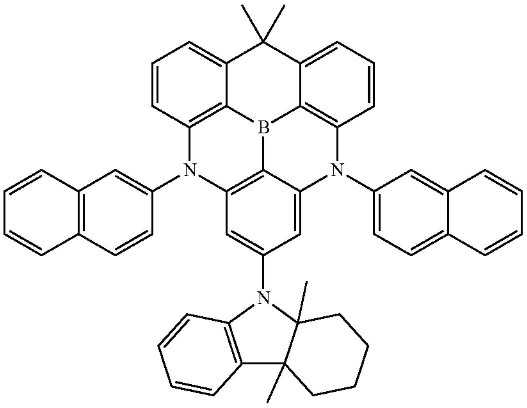
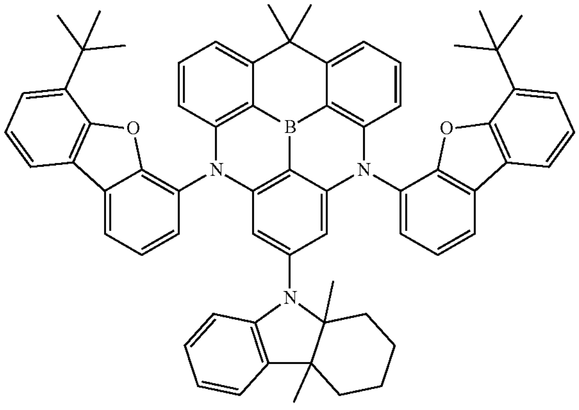
-continued
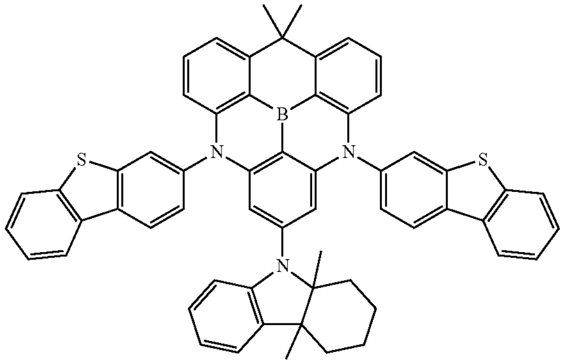
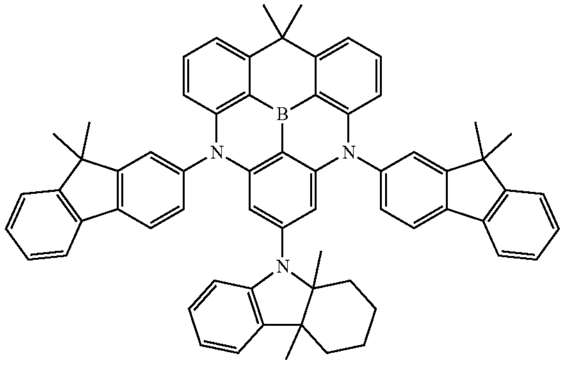
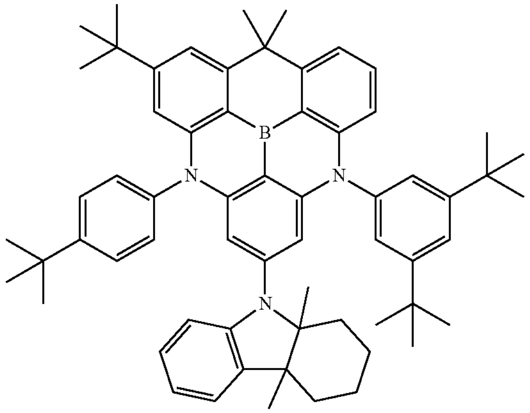
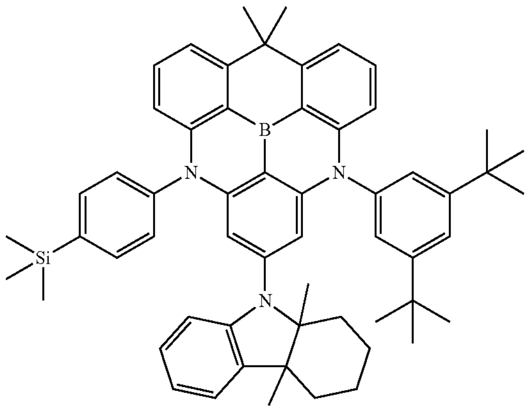

-continued
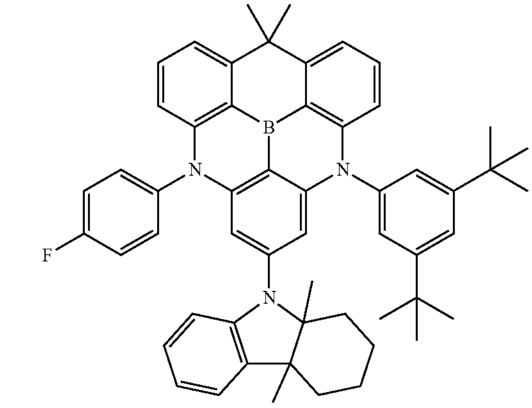
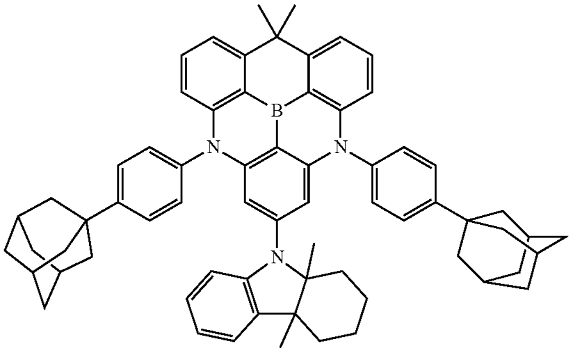
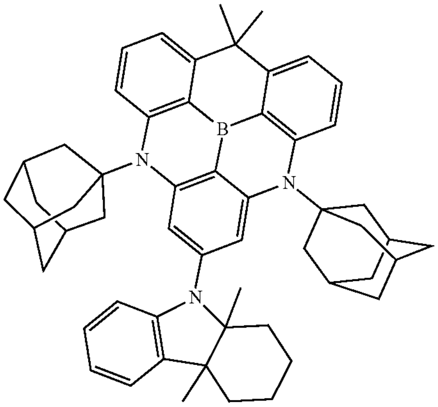
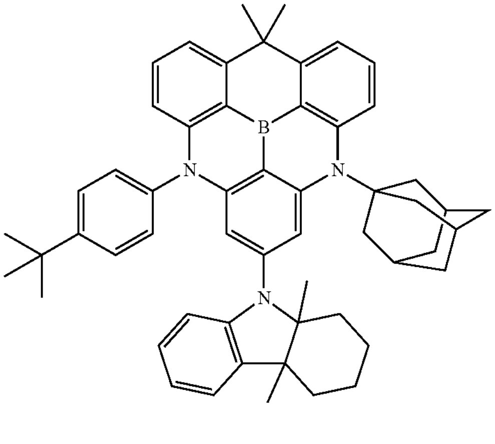
-continued
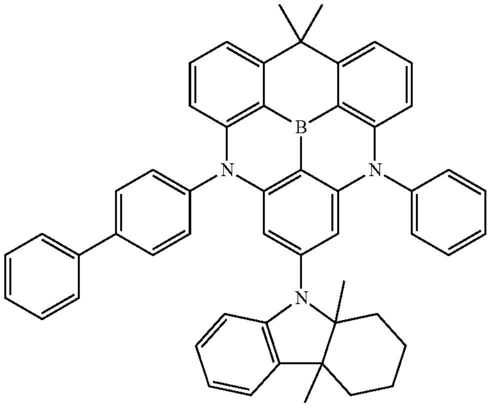
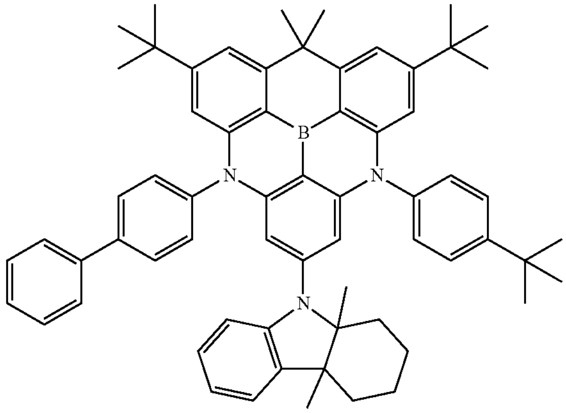
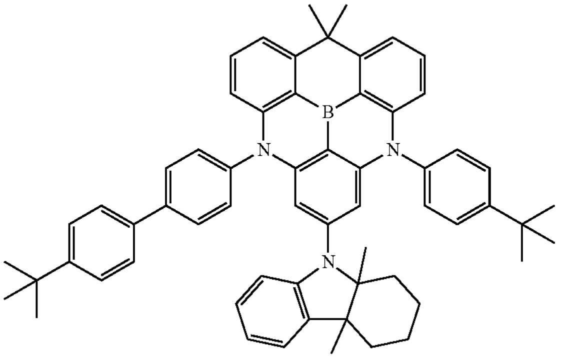
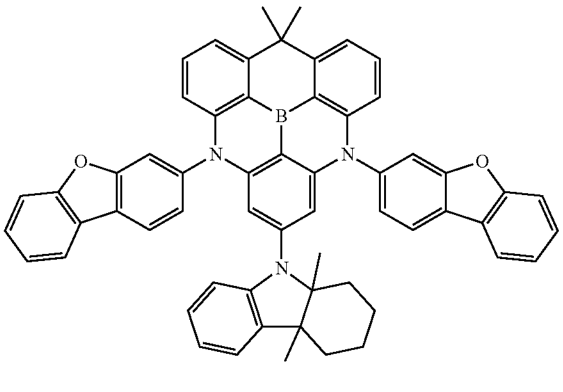

-continued
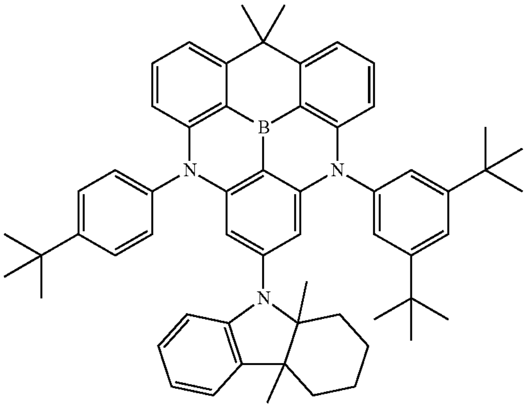
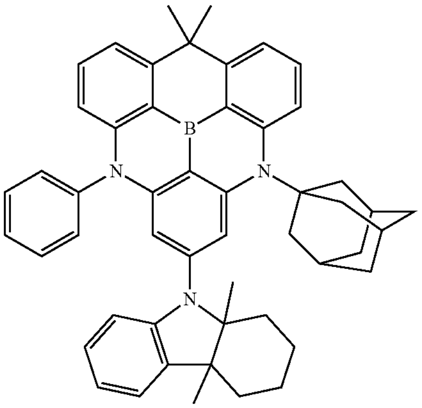
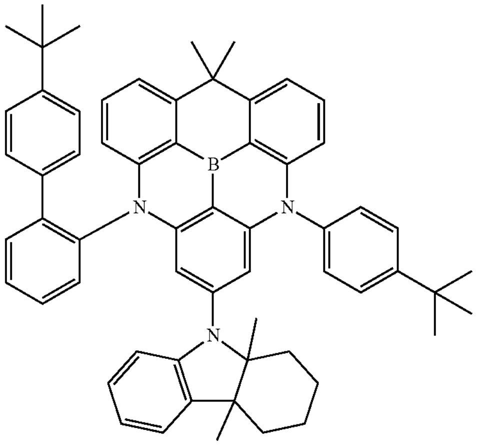
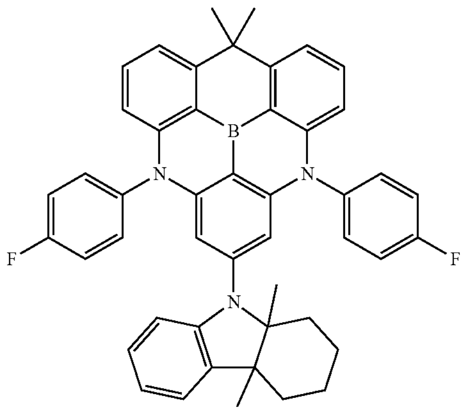
-continued
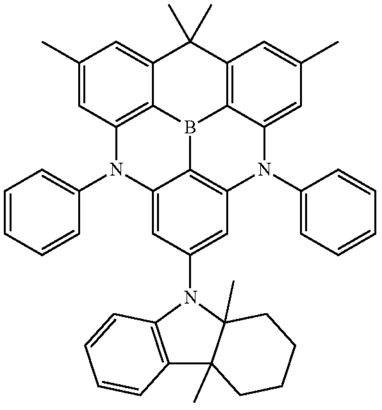
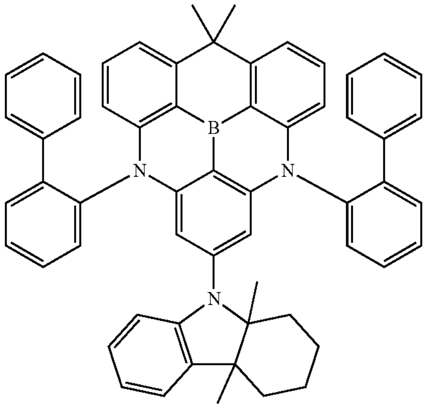
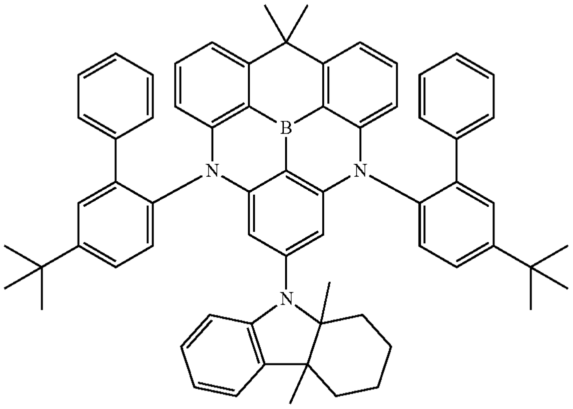
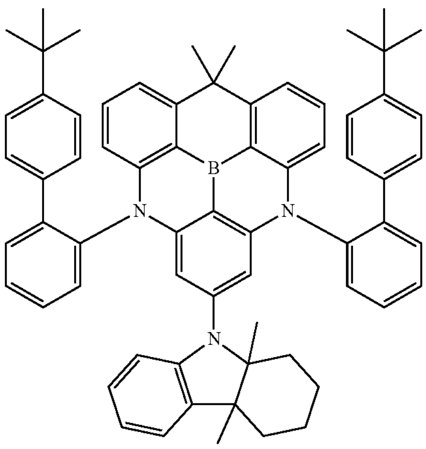

-continued
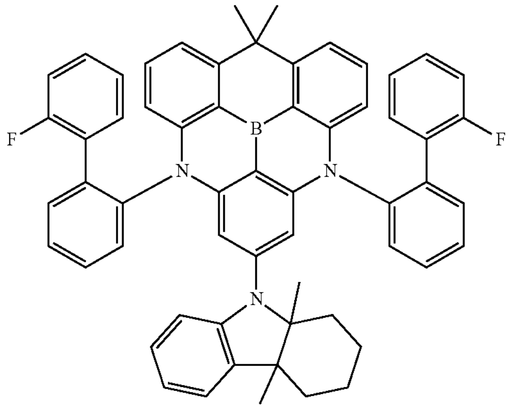
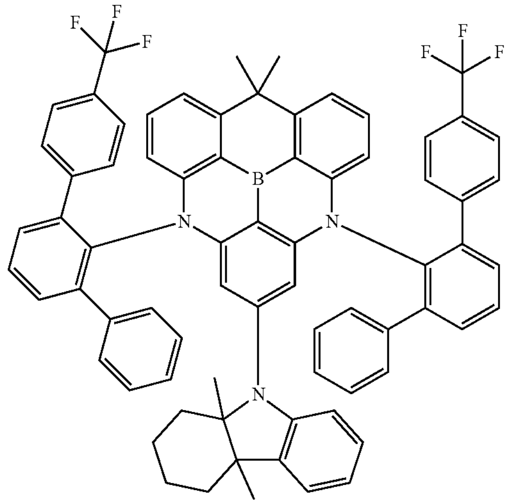
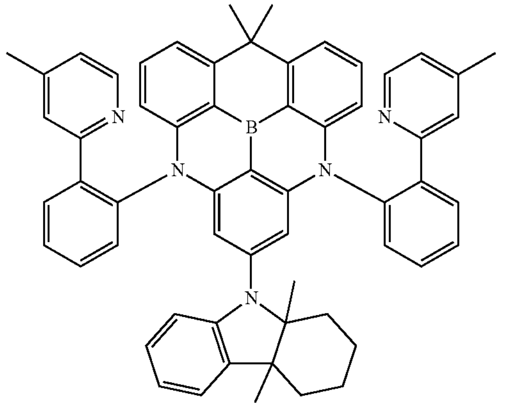
-continued
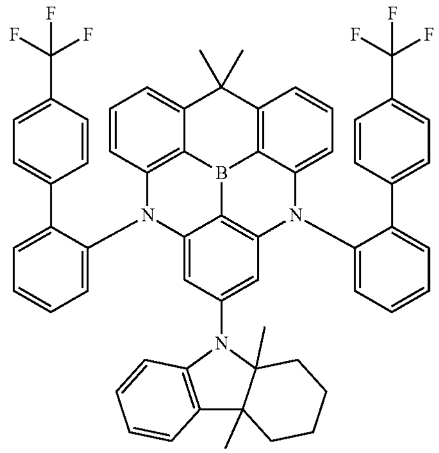
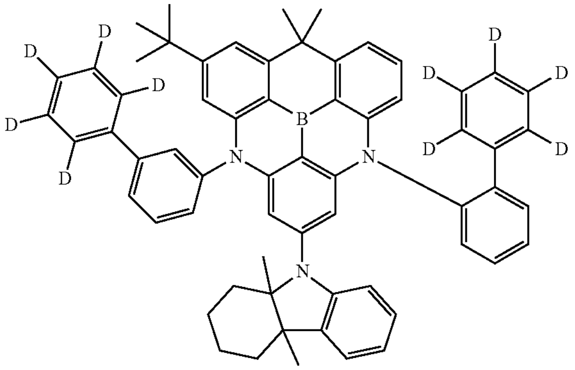
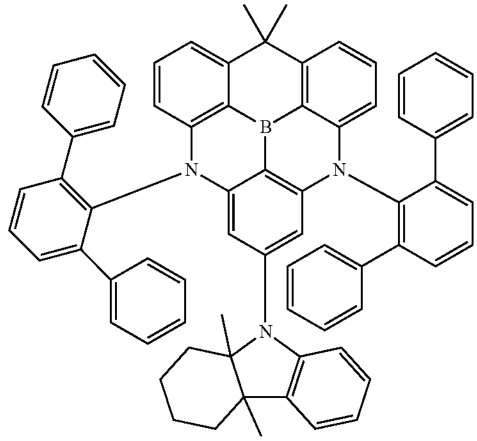
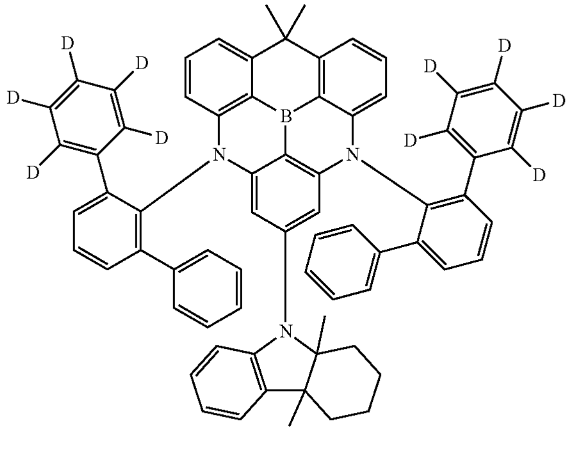

-continued
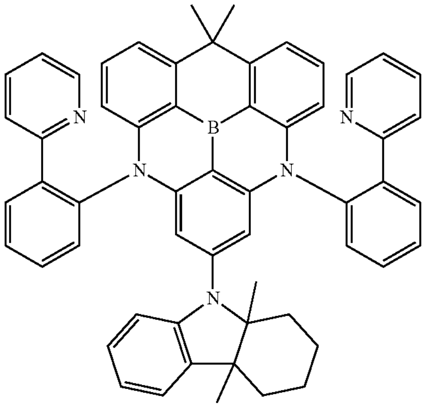
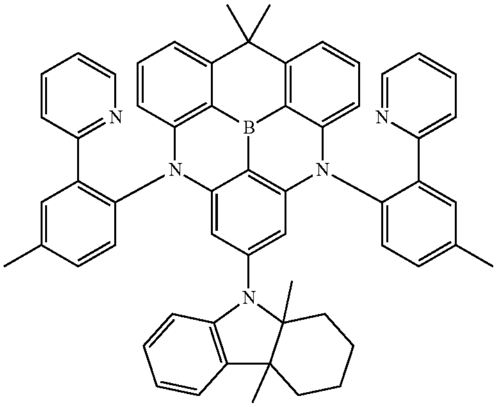
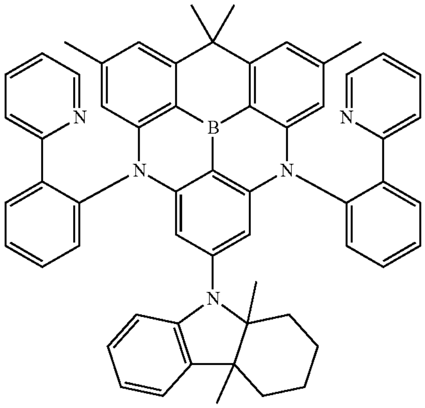
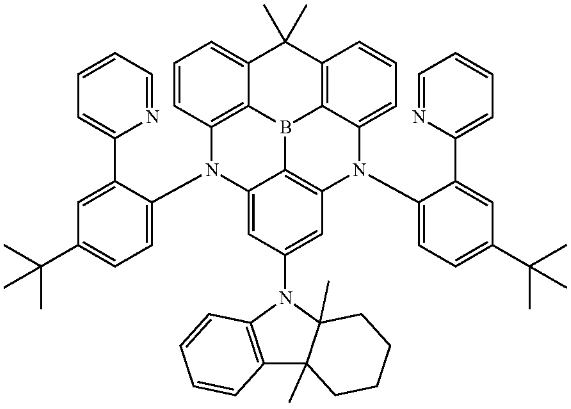
-continued
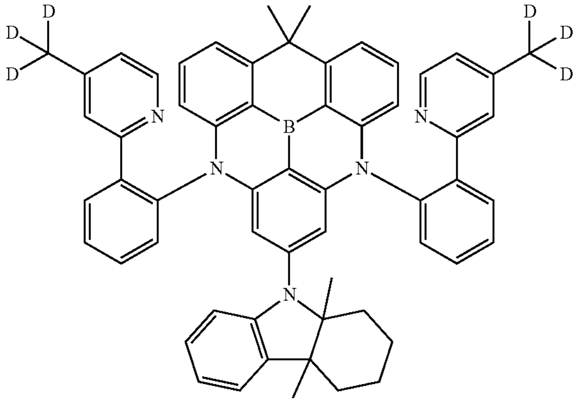
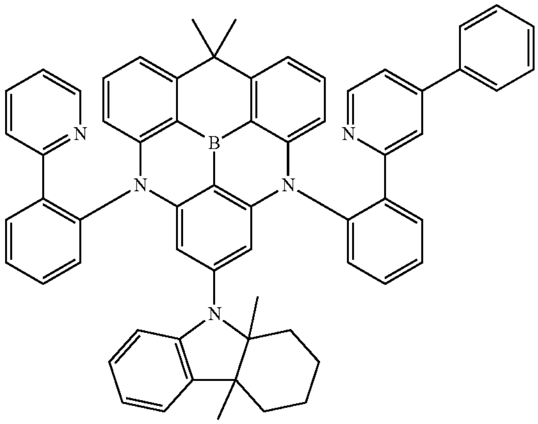
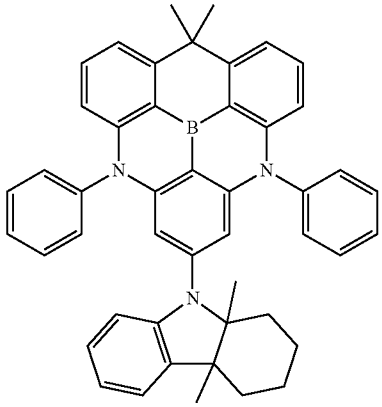
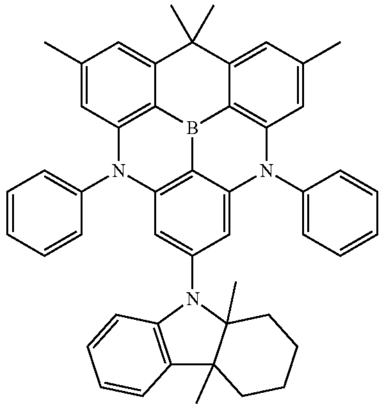

-continued
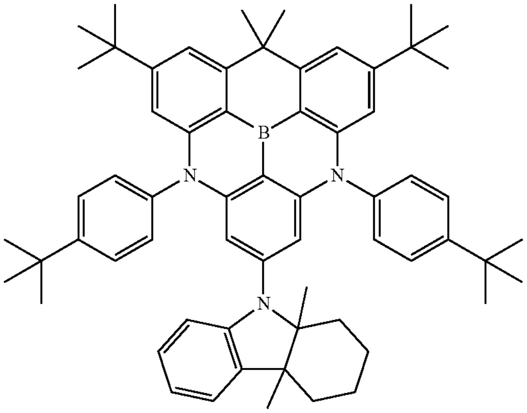
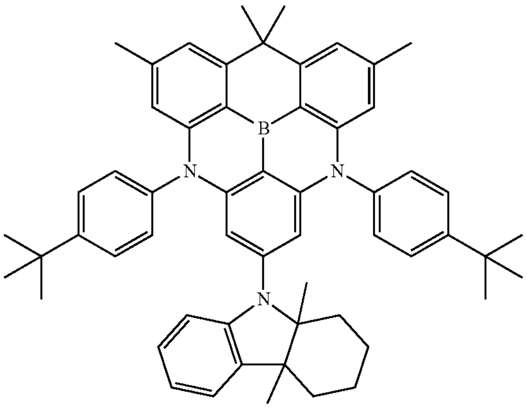
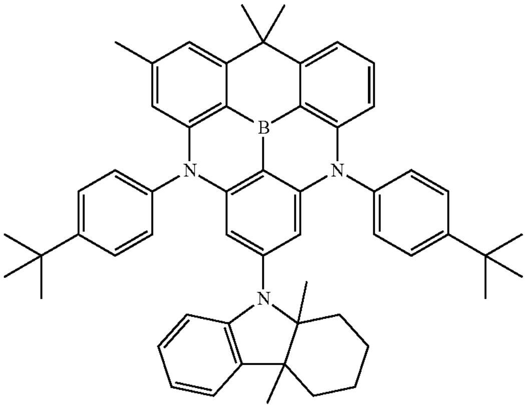
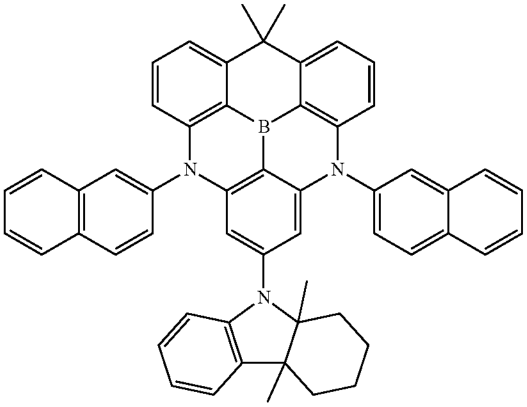
-continued
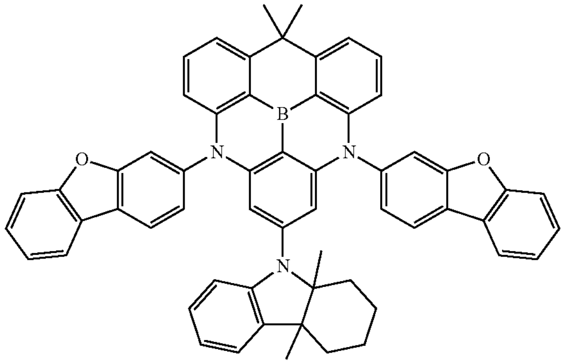
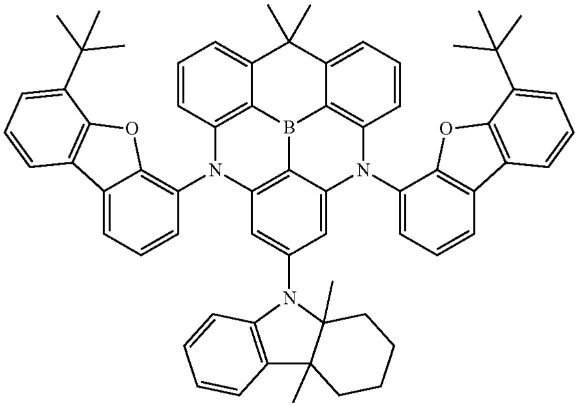
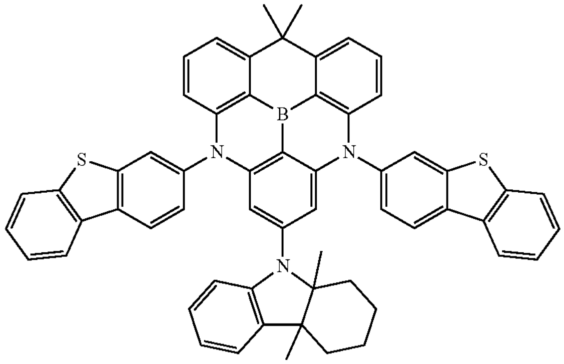
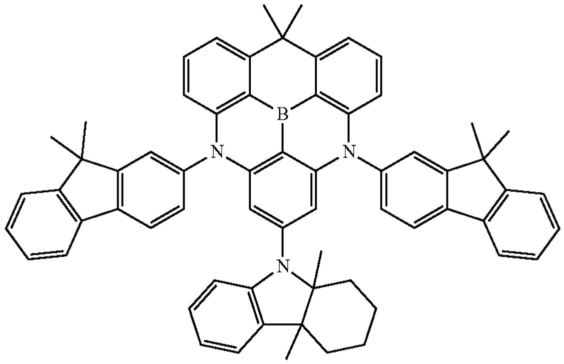

-continued
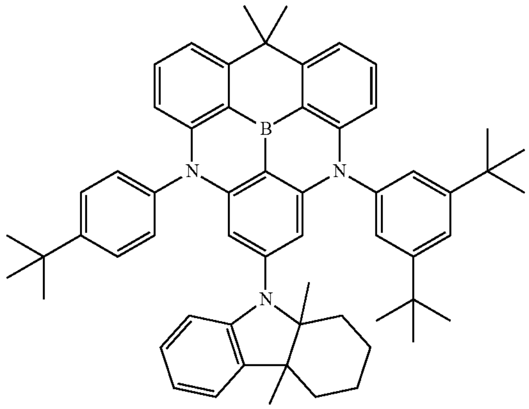
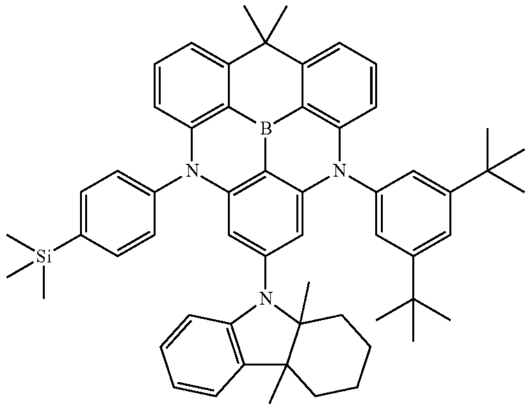
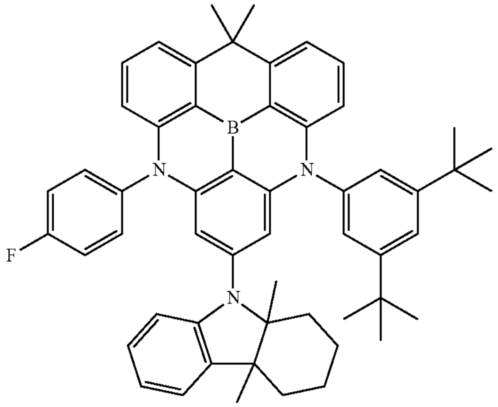
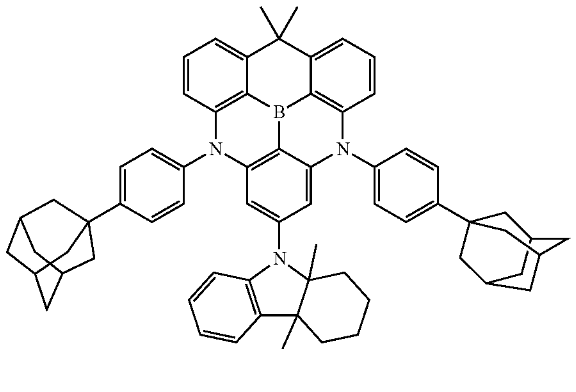
-continued
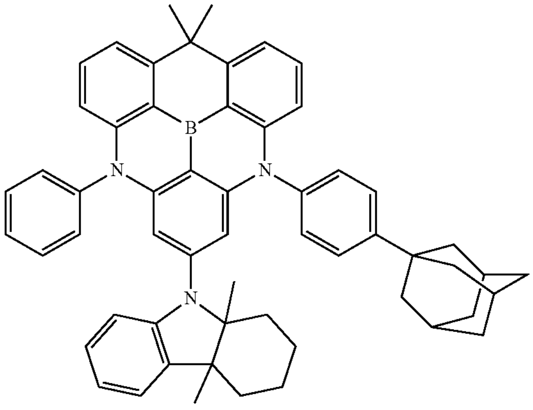
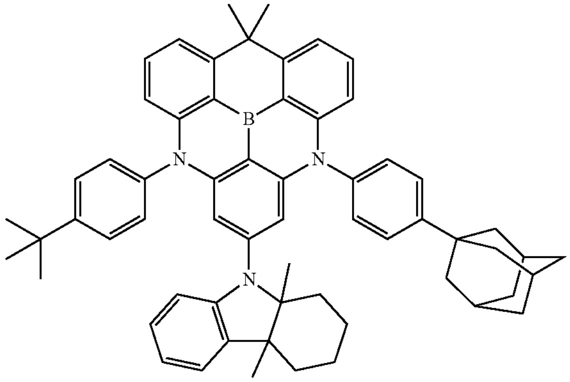
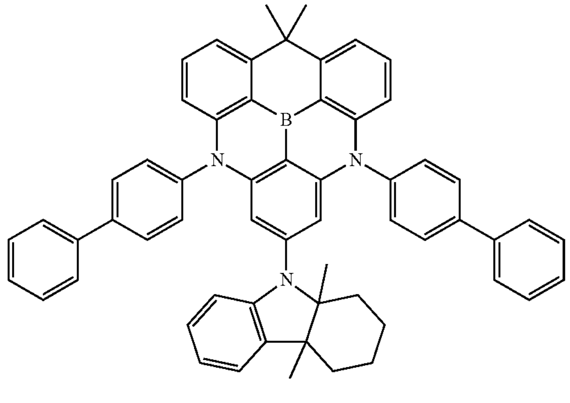
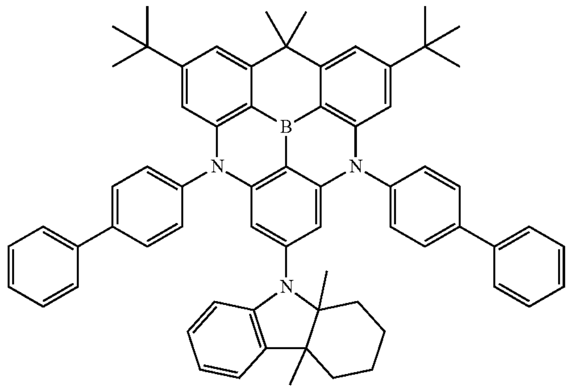

-continued
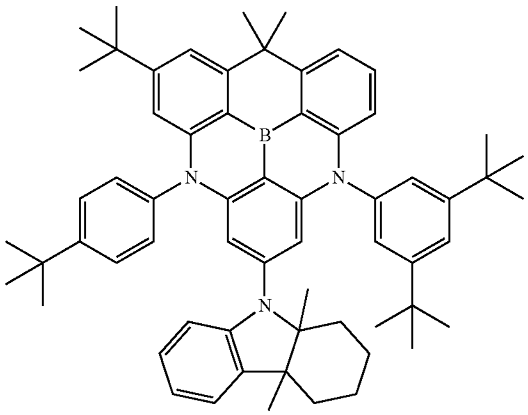
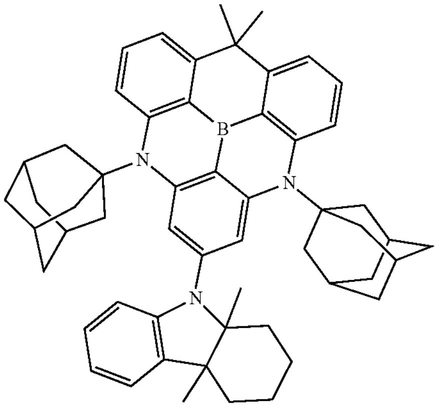
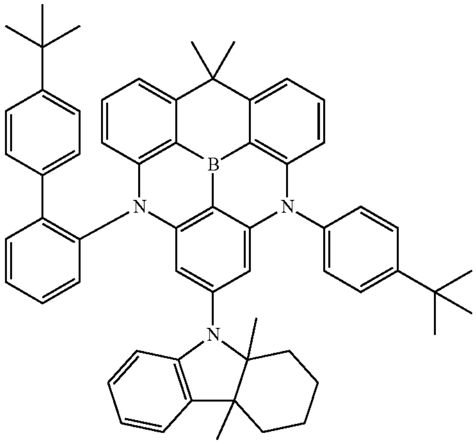
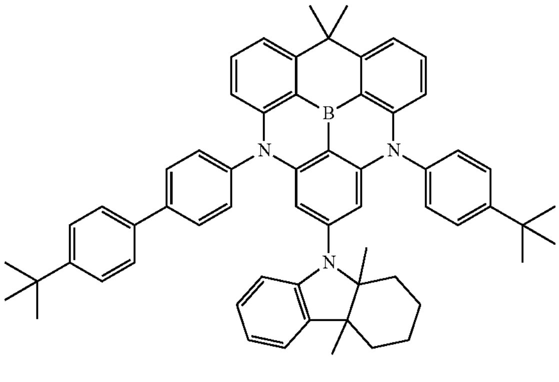
-continued
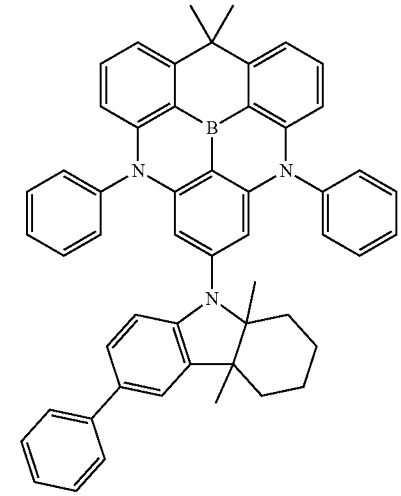
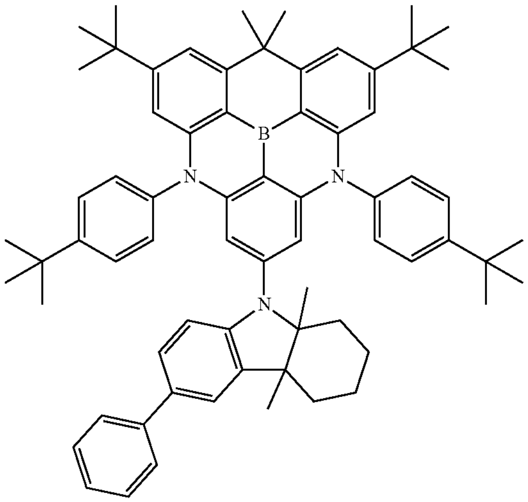
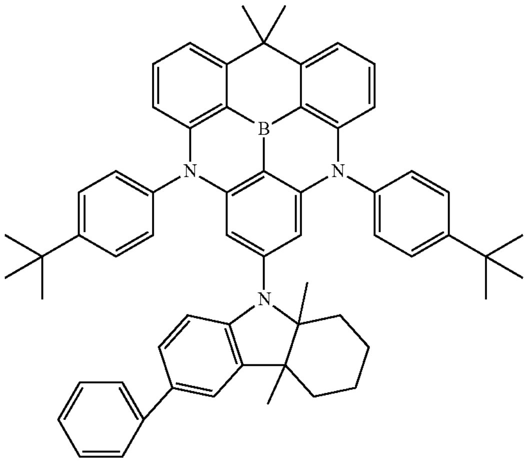

-continued
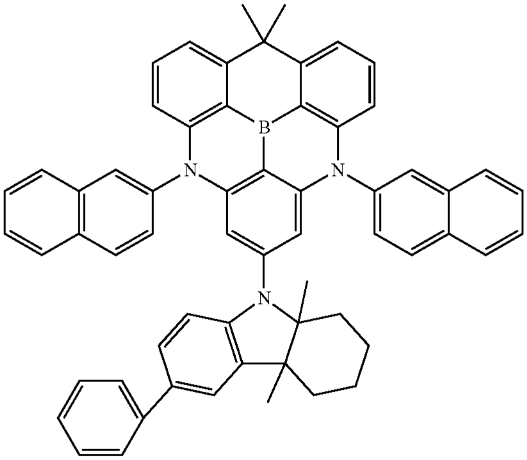
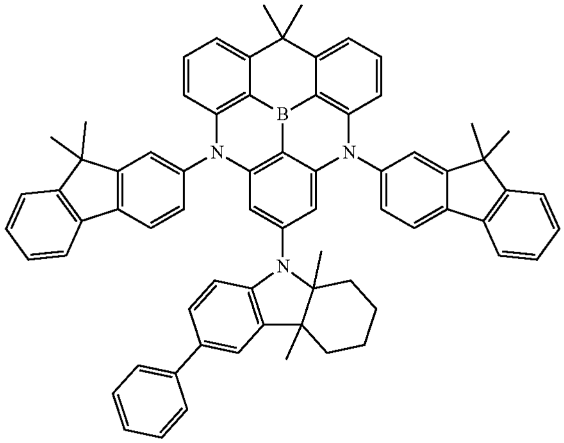
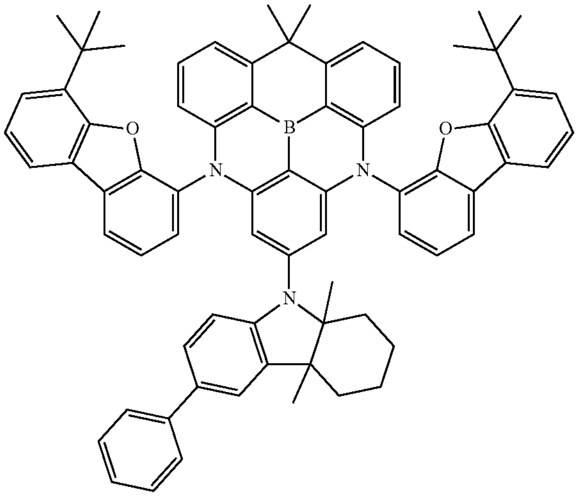
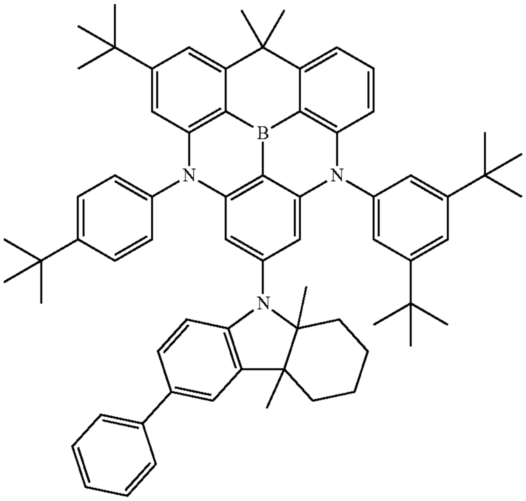
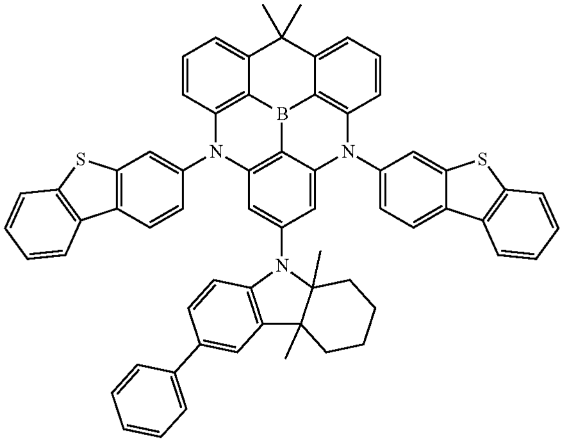
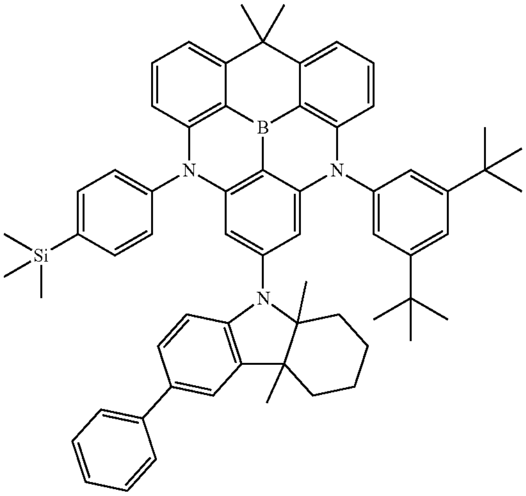
-continued

4449
-continued
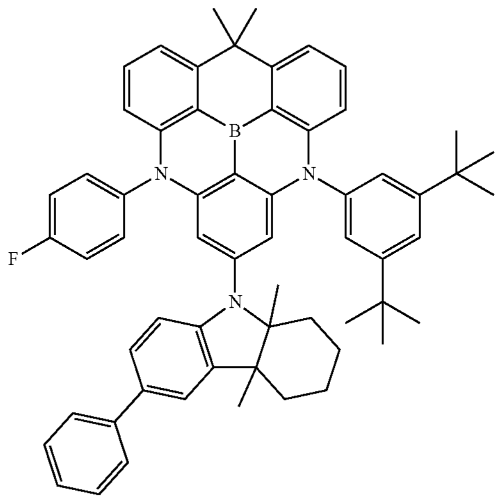
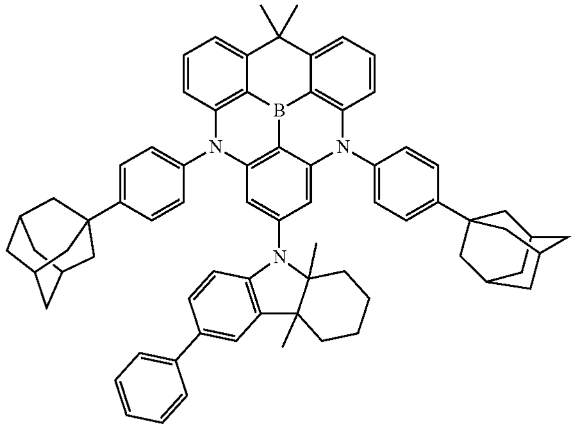
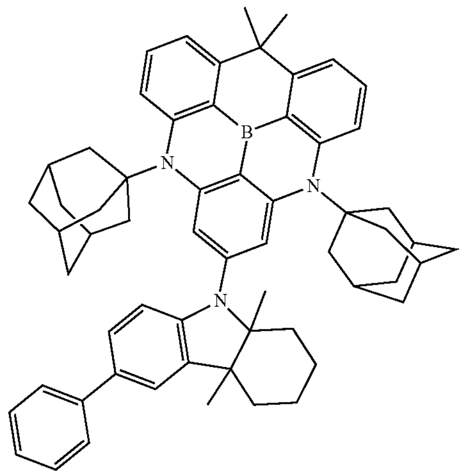
4450
-continued
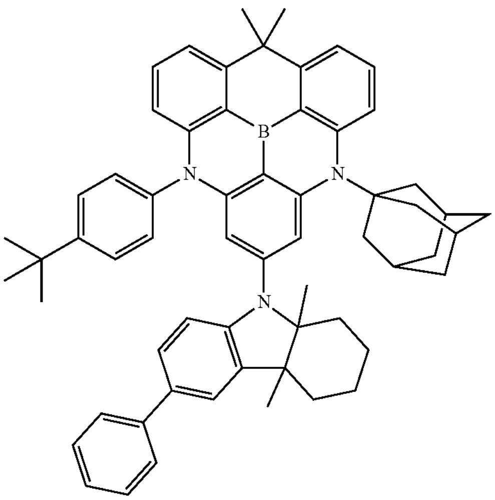
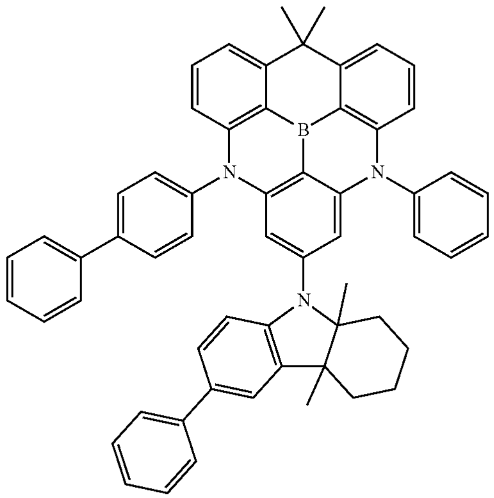
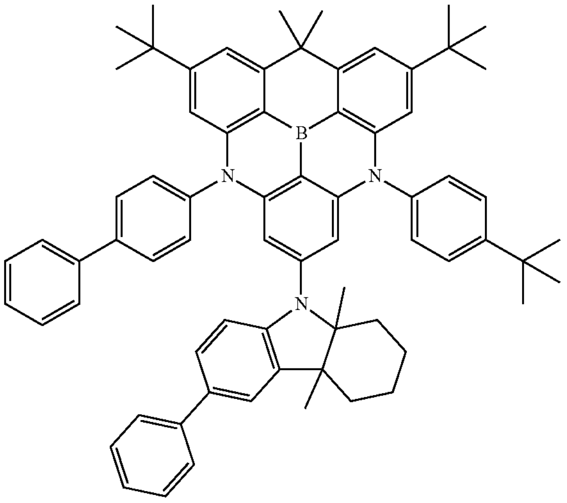

-continued
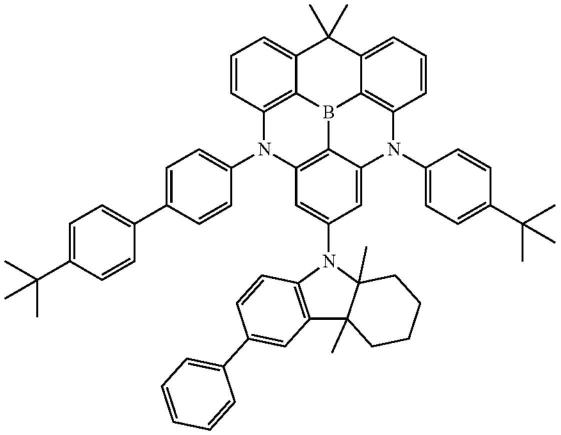
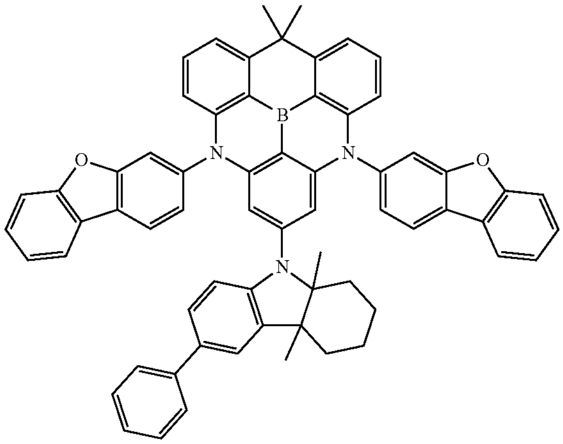
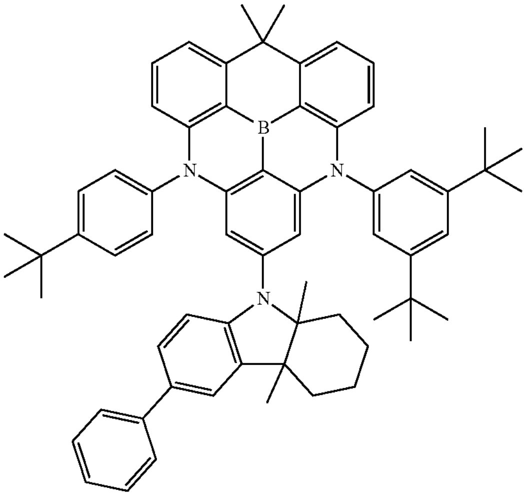
-continued
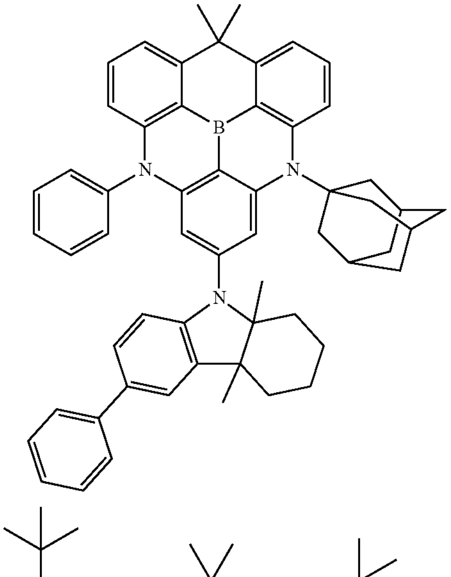
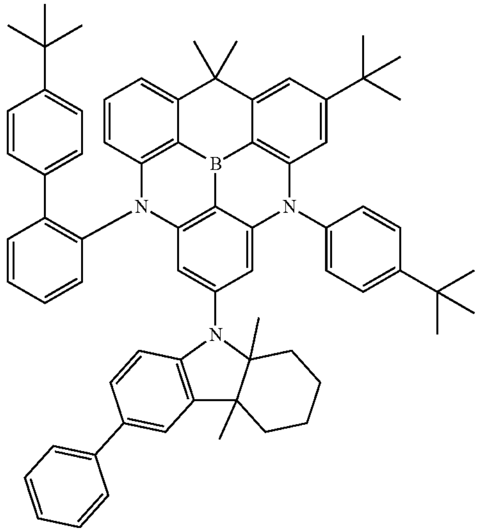
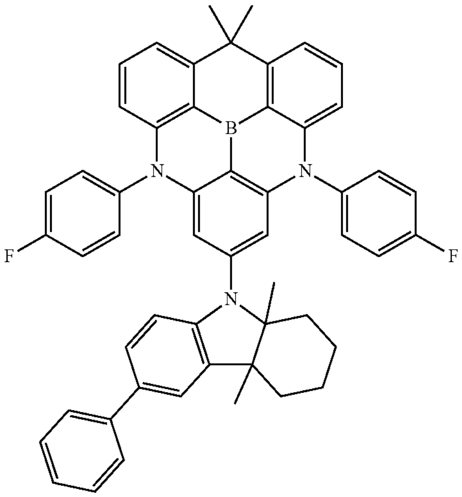

-continued
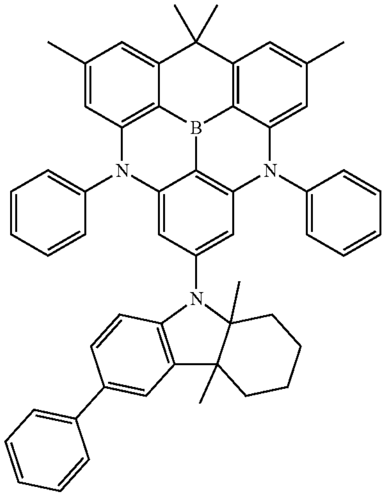
-continued
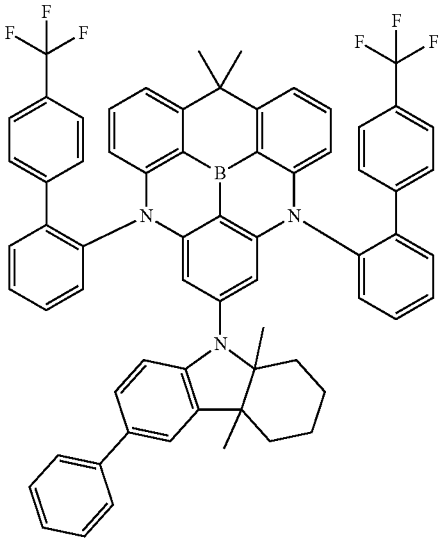
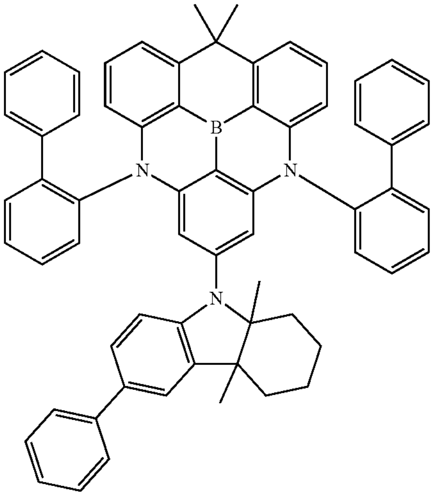
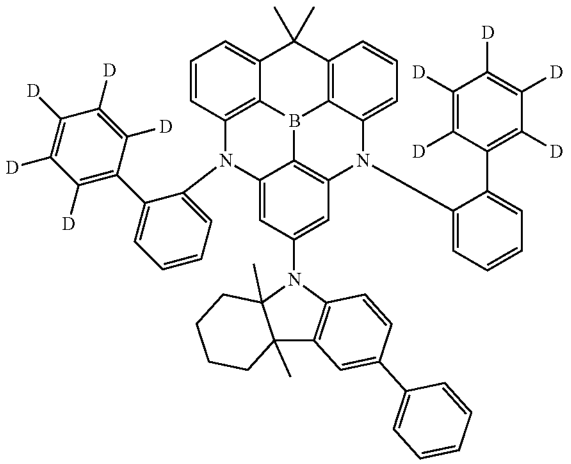
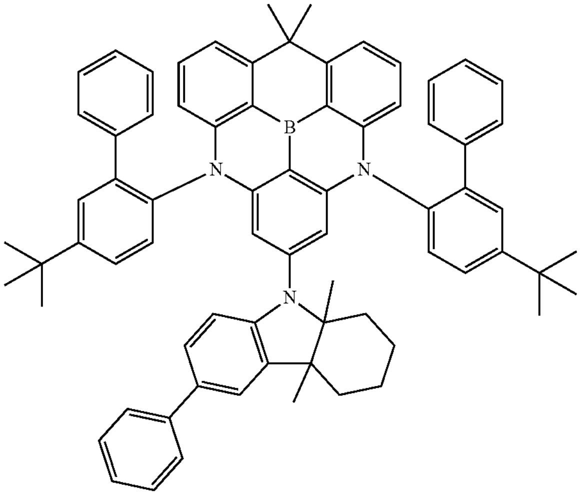
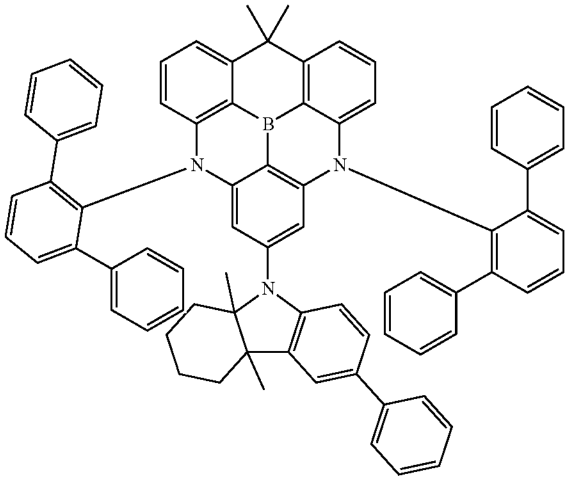

-continued
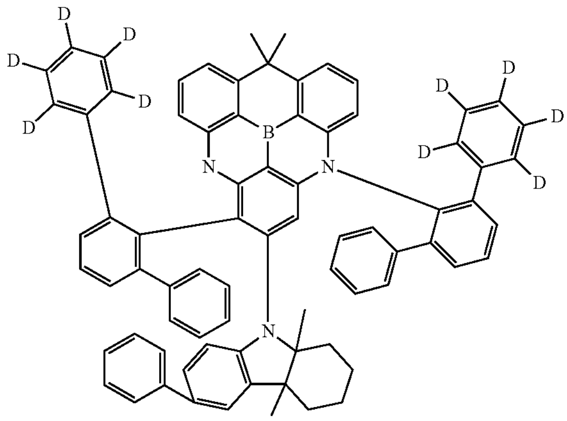
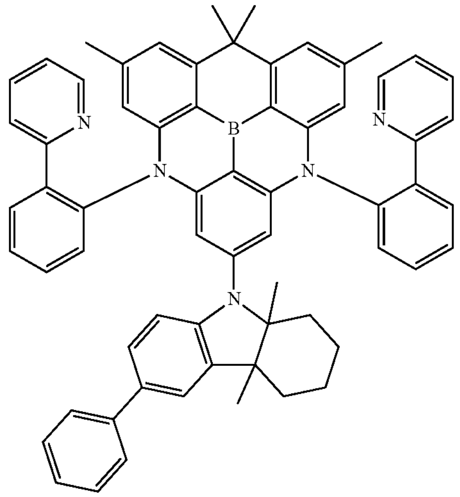
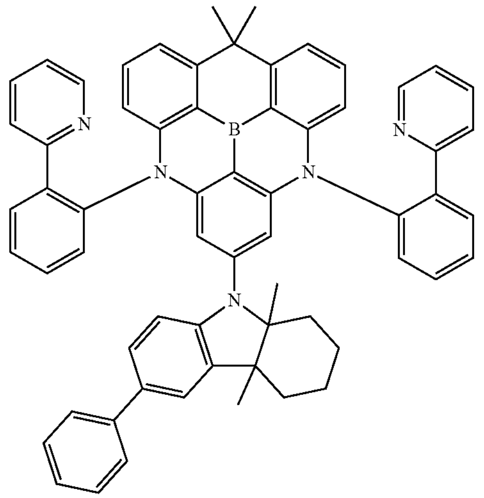
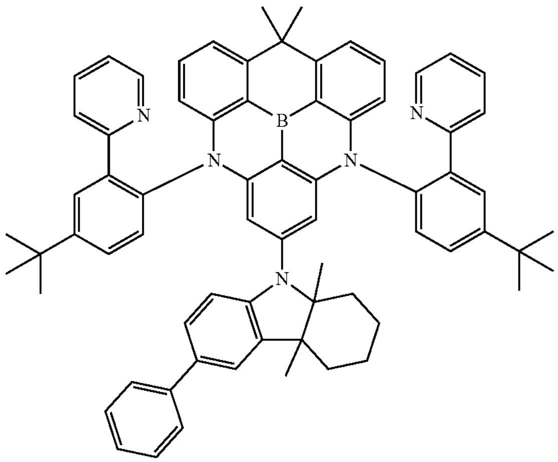
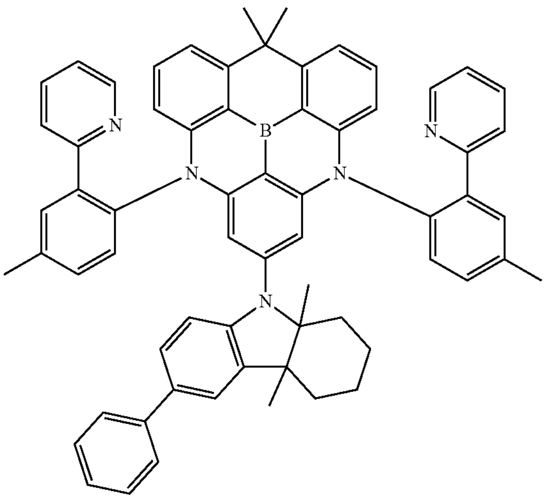
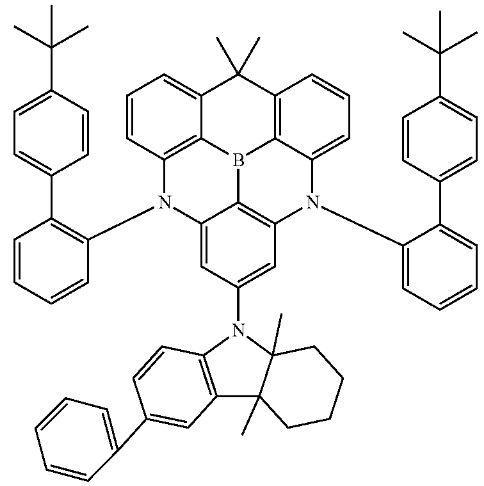
-continued -continued
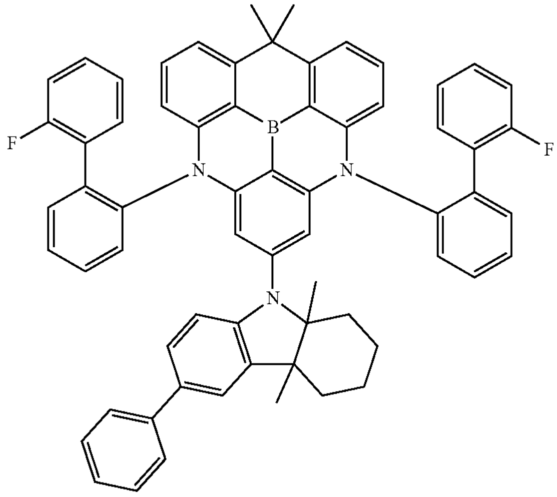
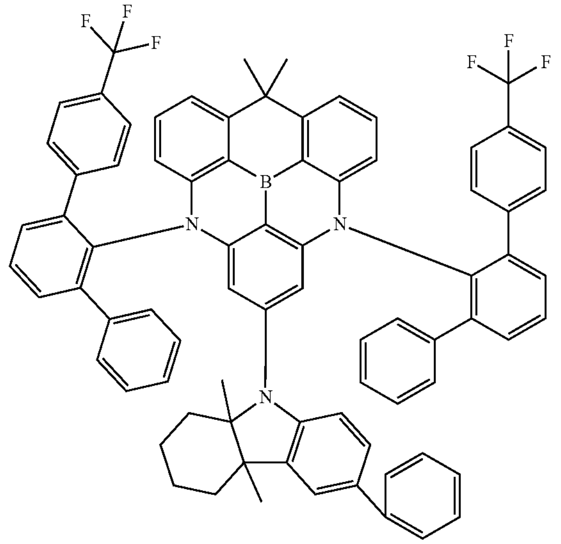
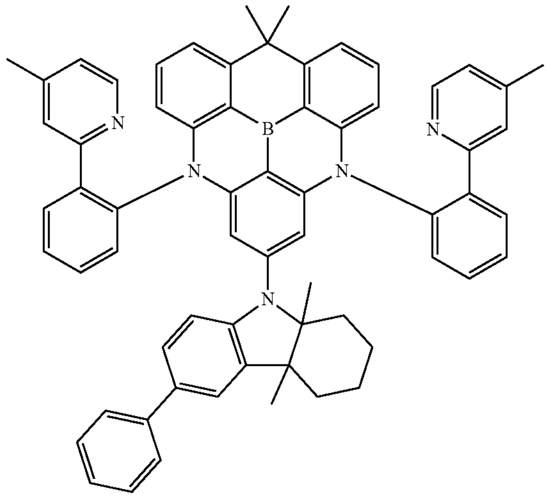
-continued
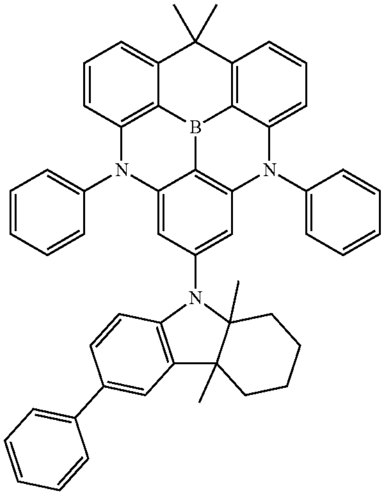
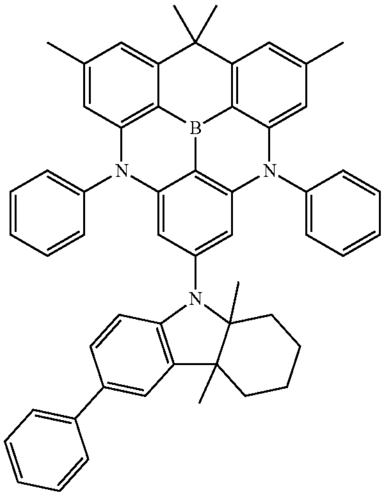
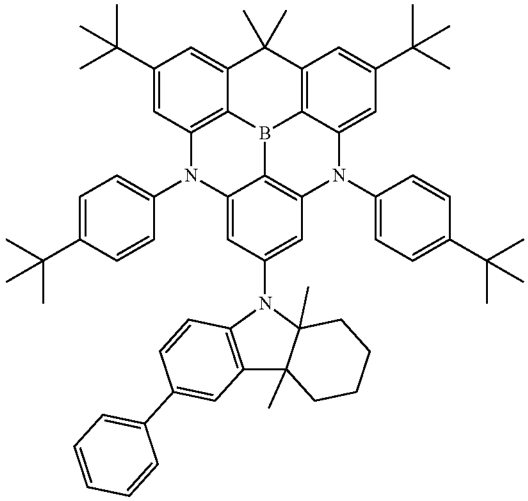

-continued
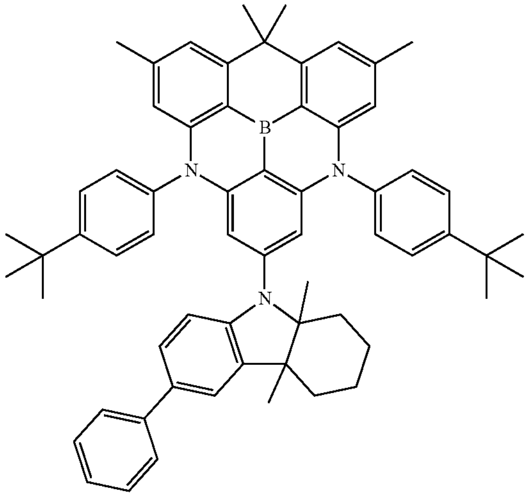
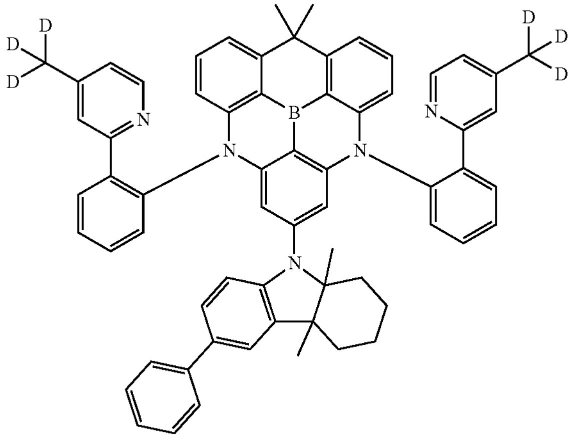
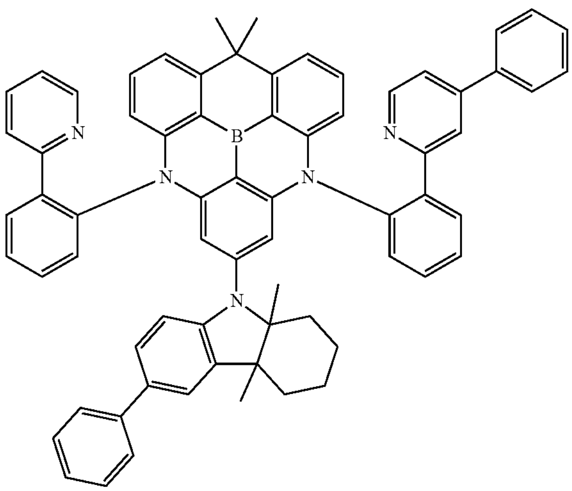
-continued
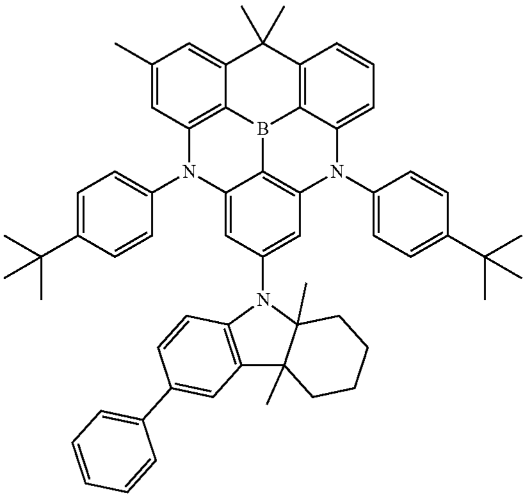
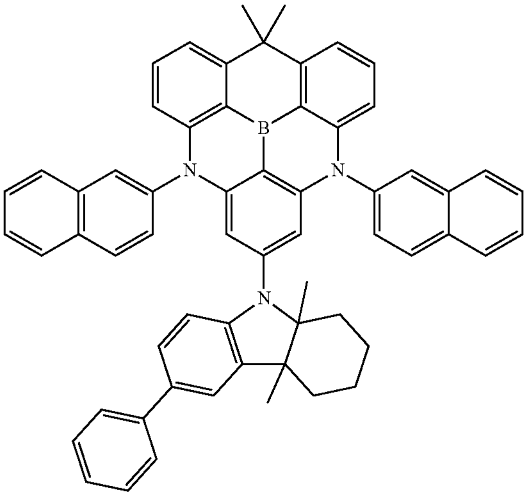
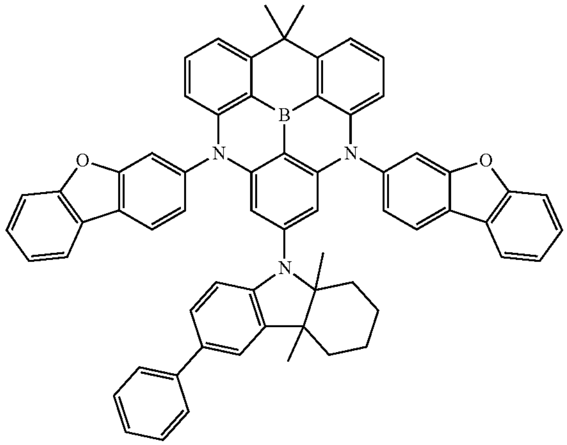

-continued
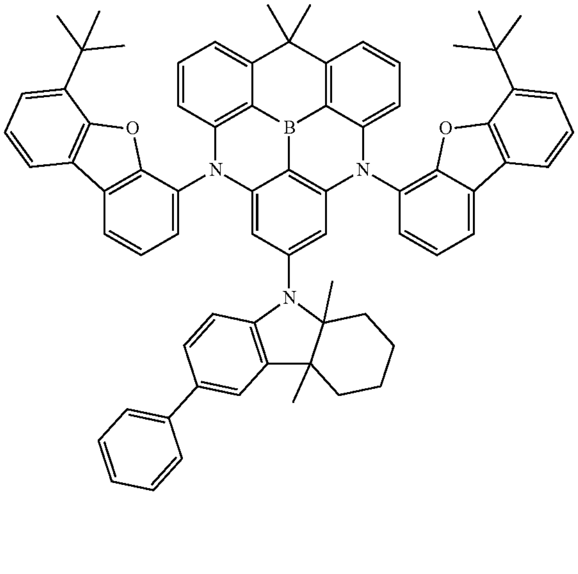
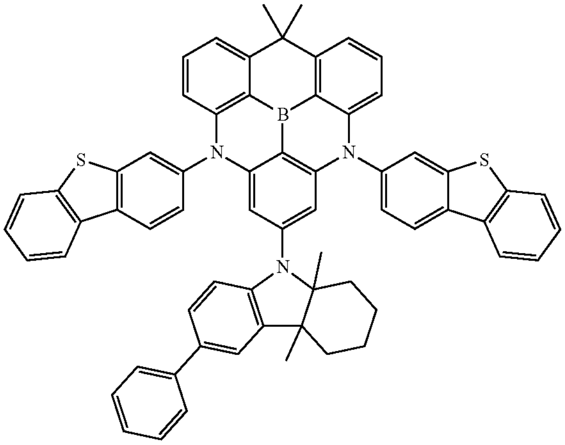
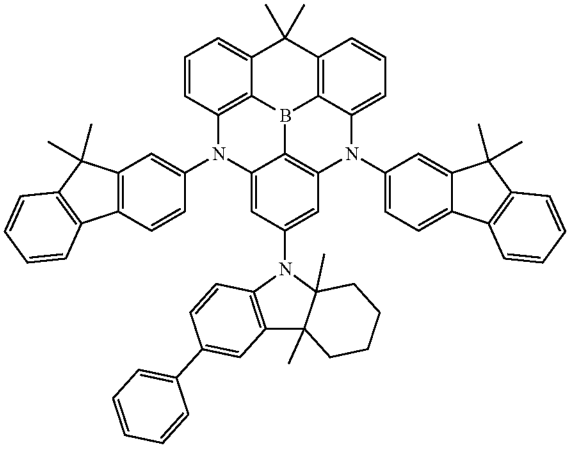
-continued
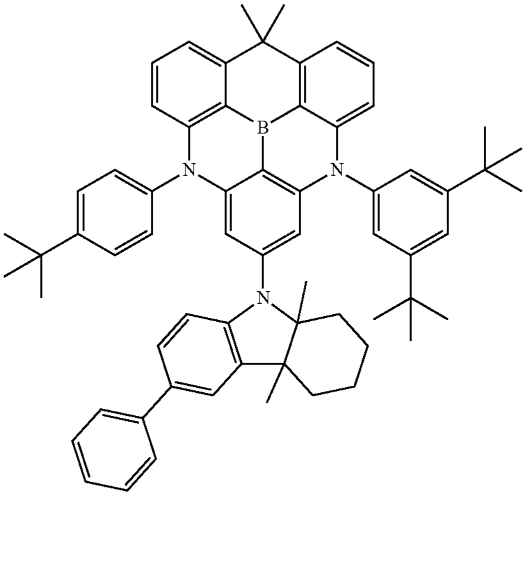
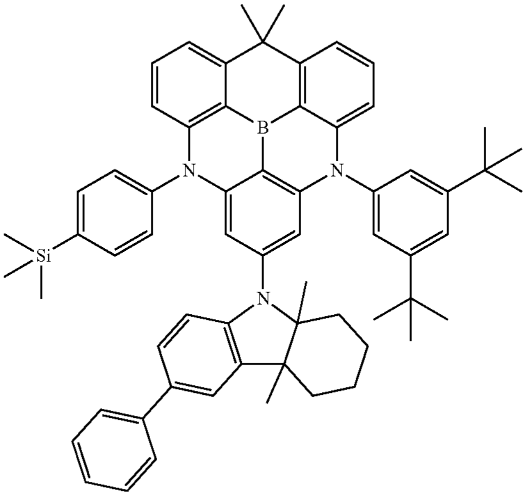
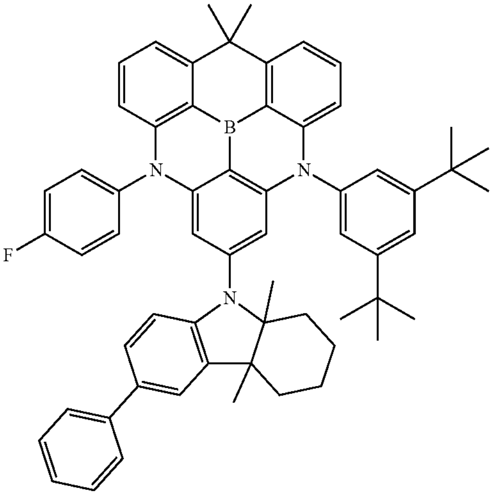

-continued
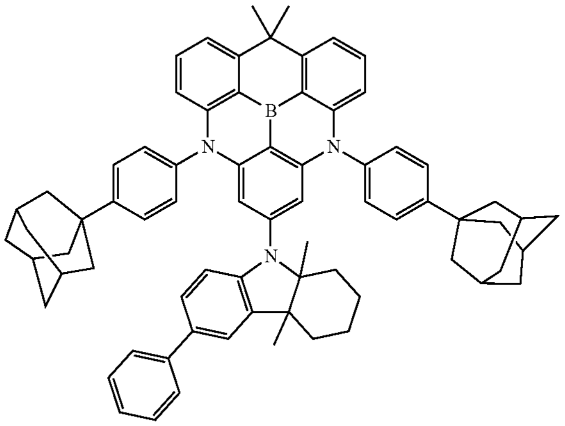
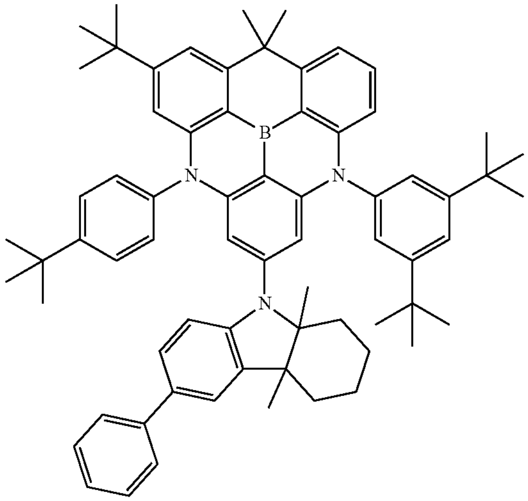
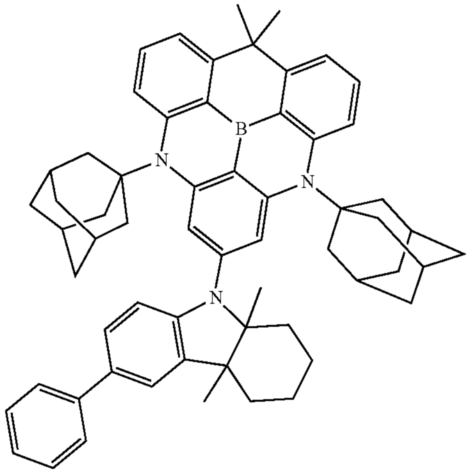
-continued
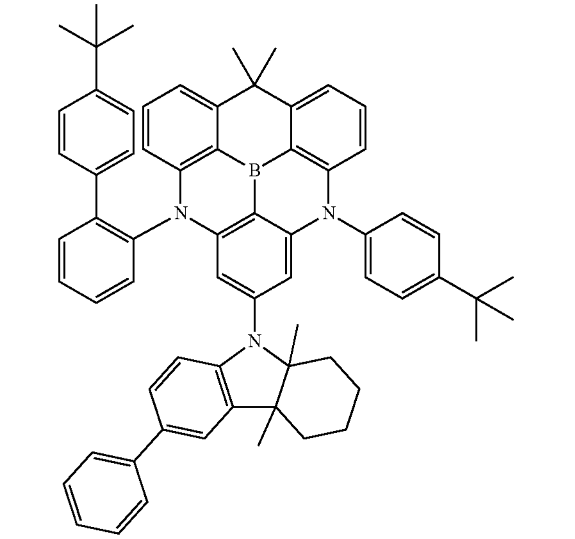
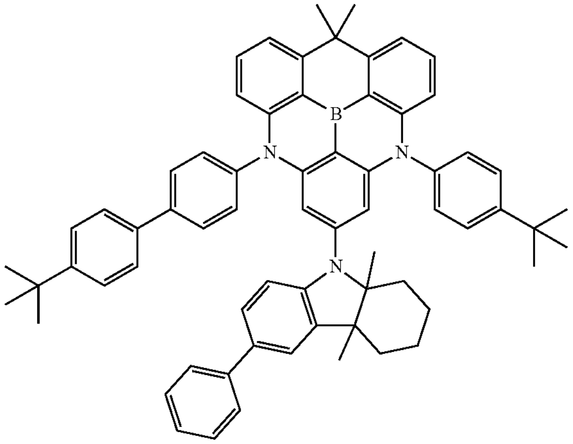
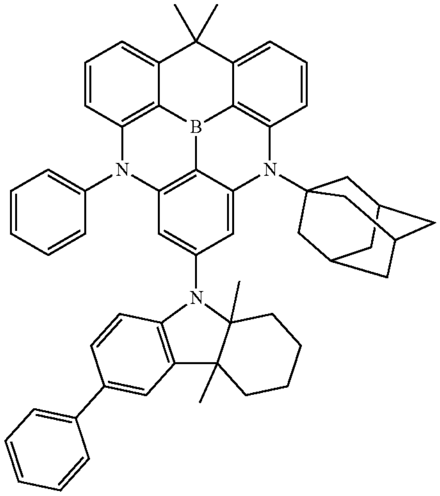

-continued
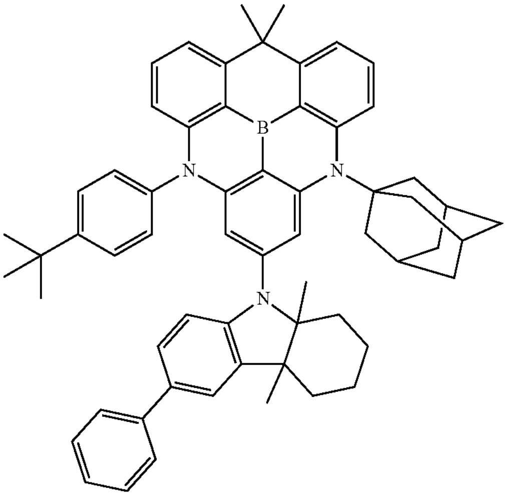
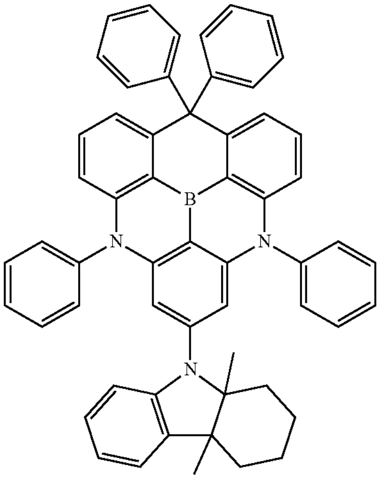
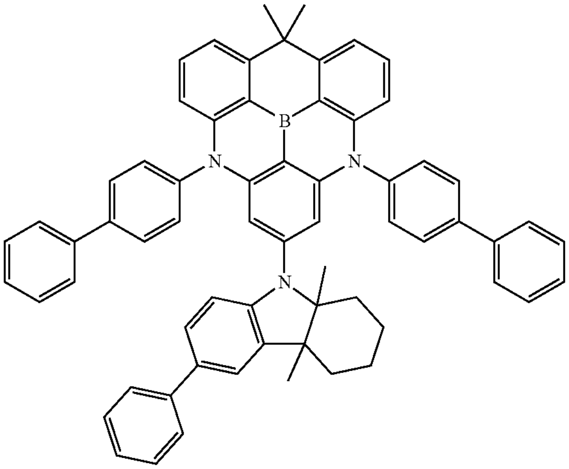
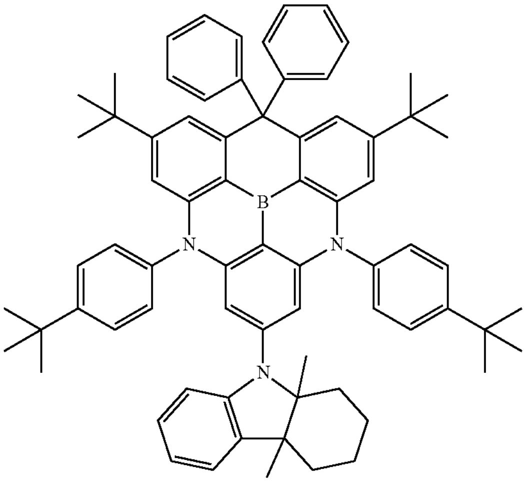
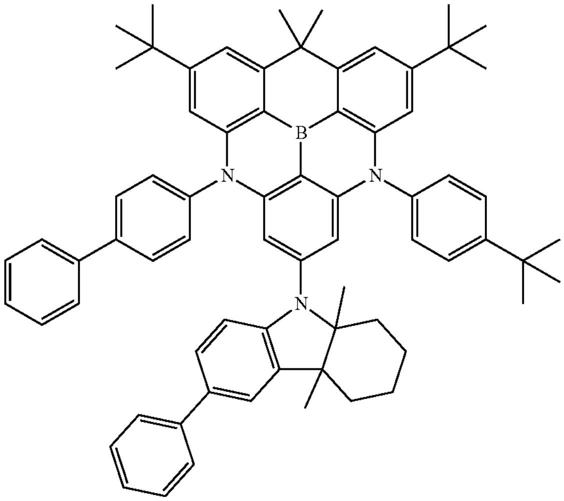
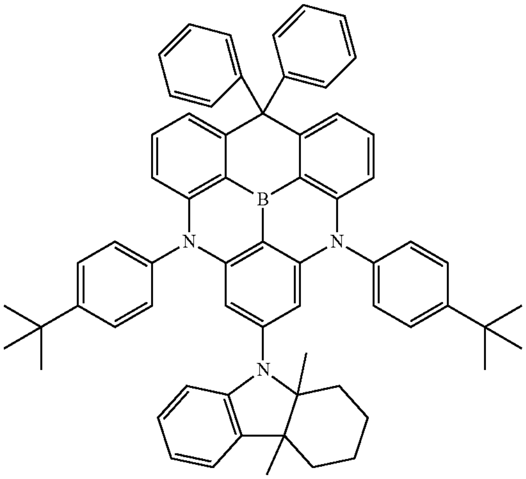
-continued

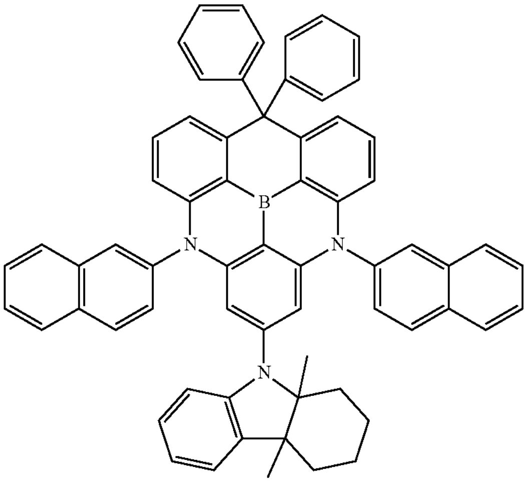
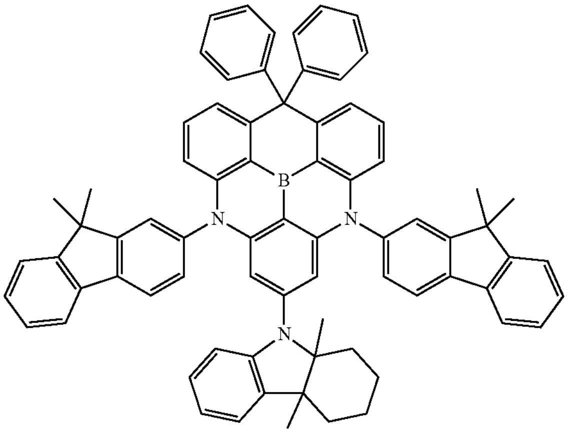
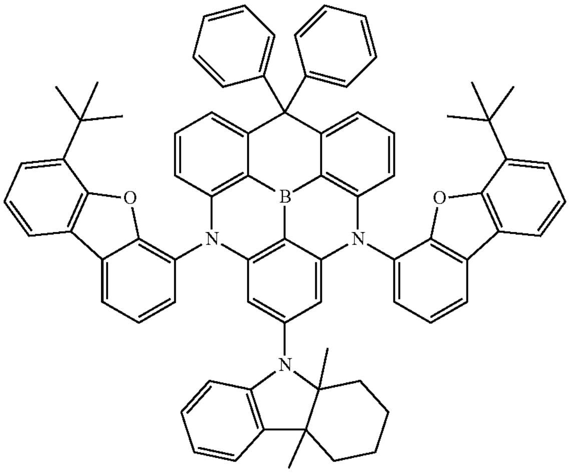
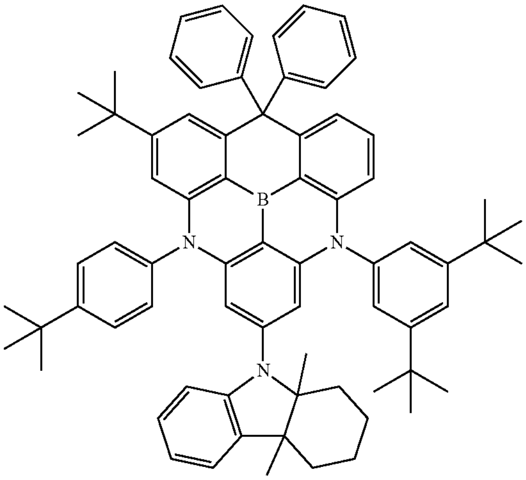
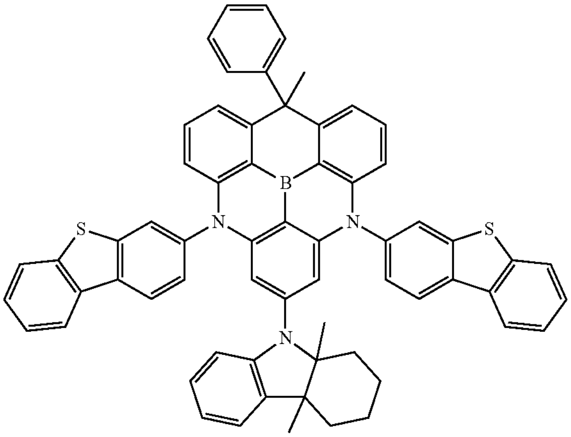
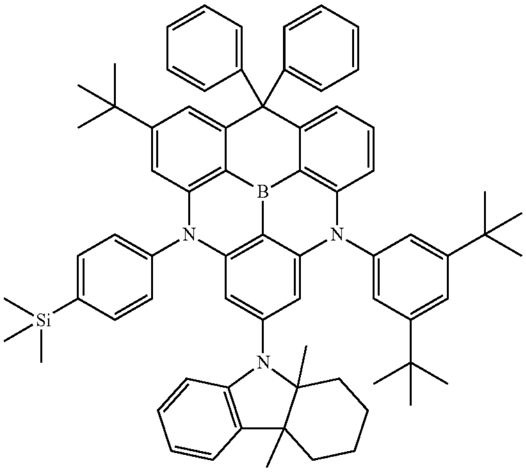

-continued
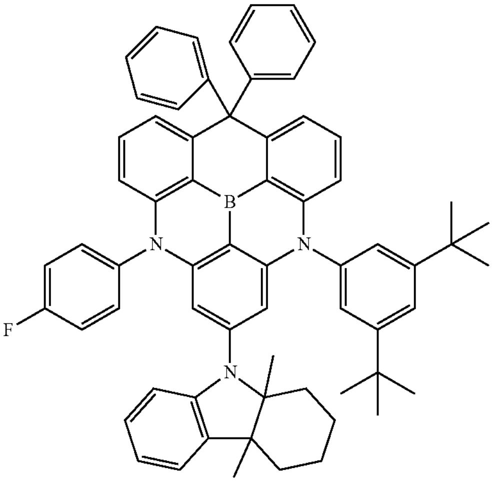
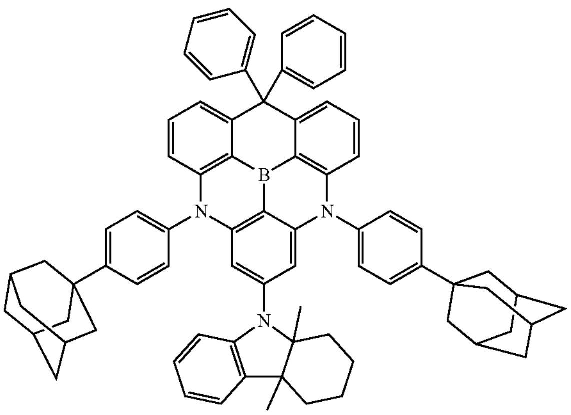
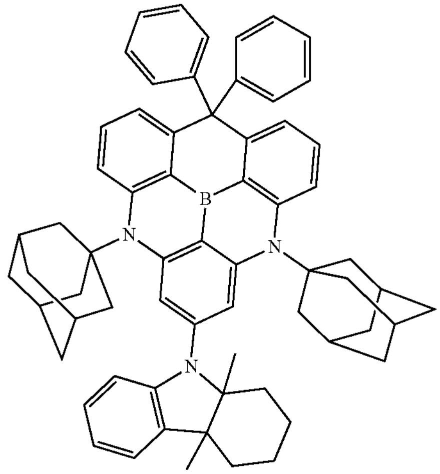
-continued
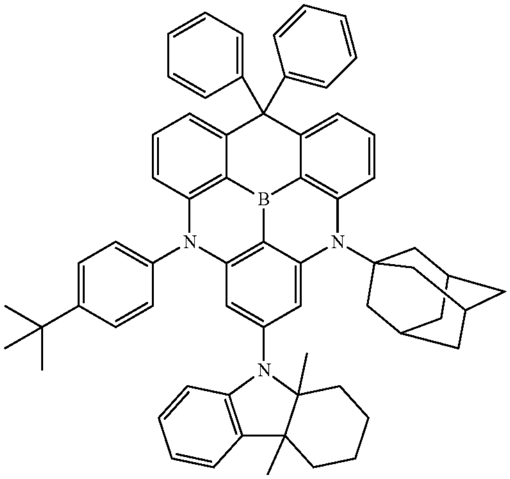
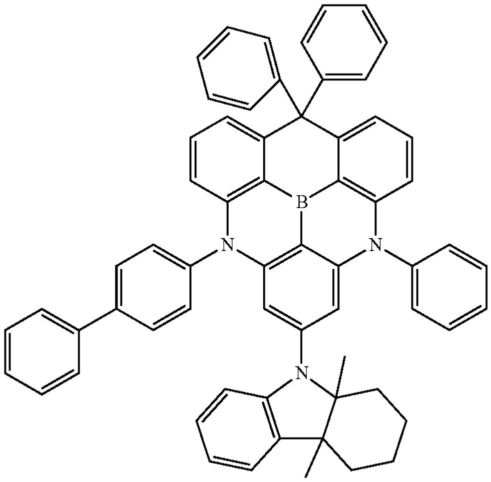
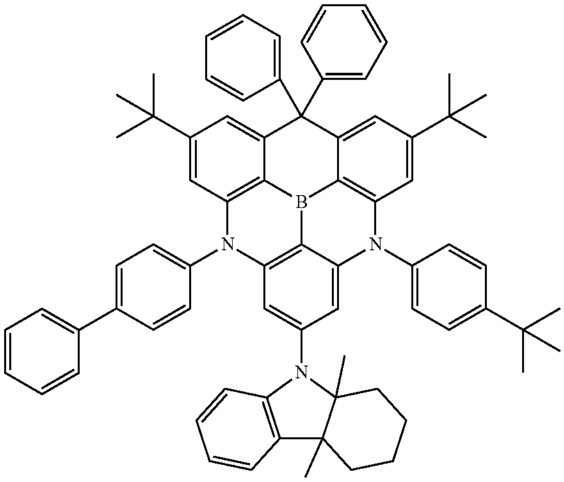

-continued
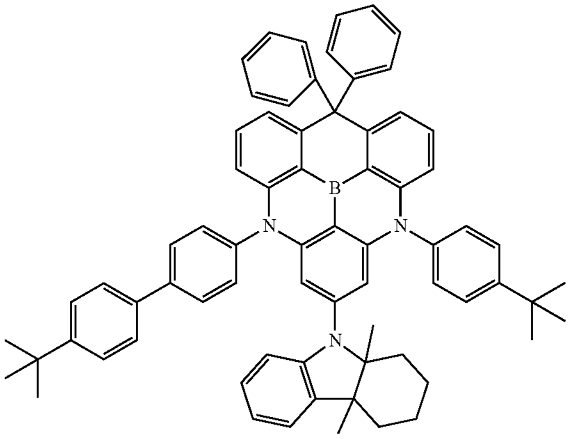
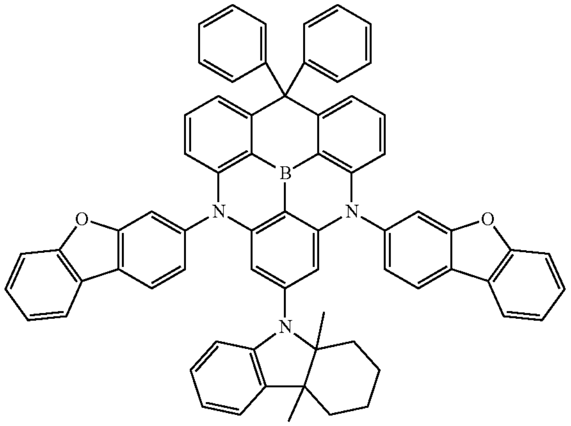
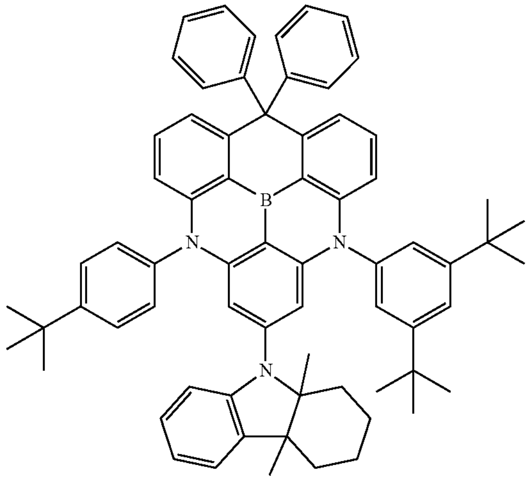
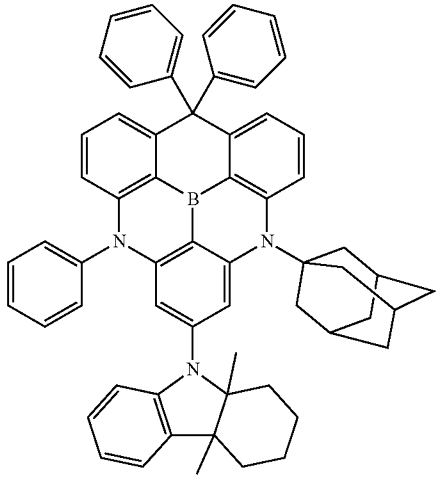
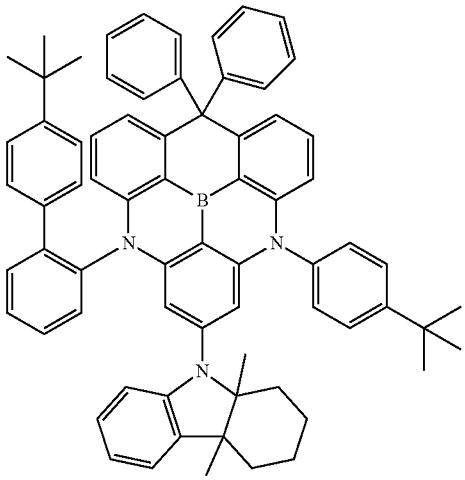
-continued
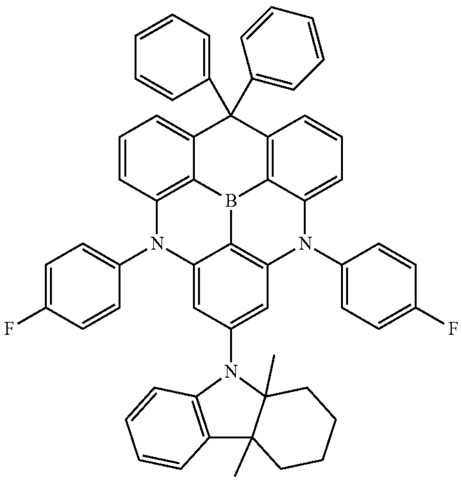

-continued
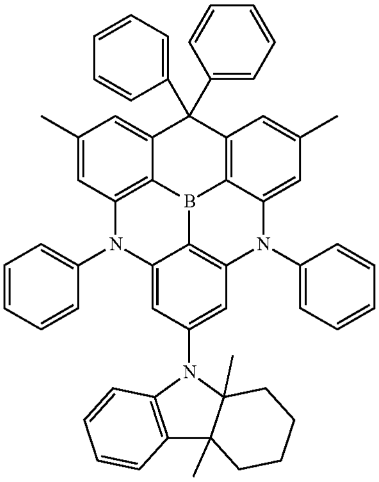
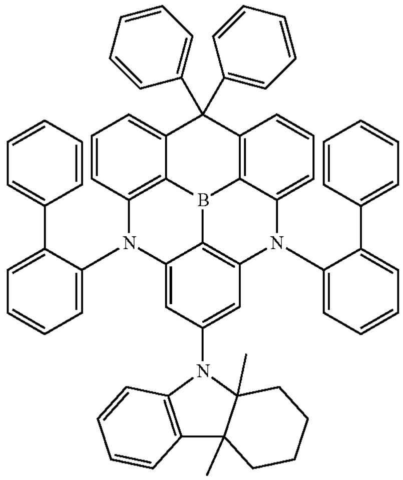
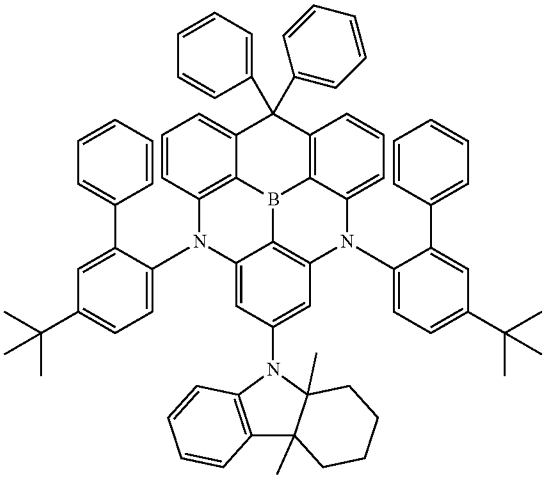
-continued
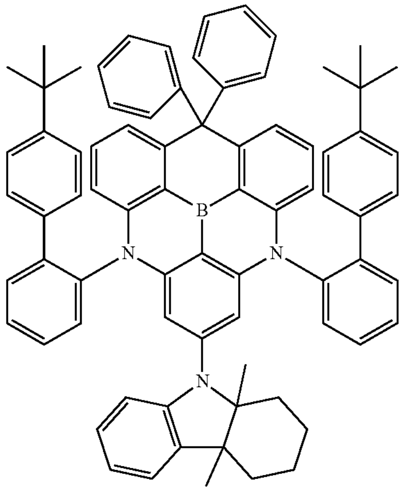
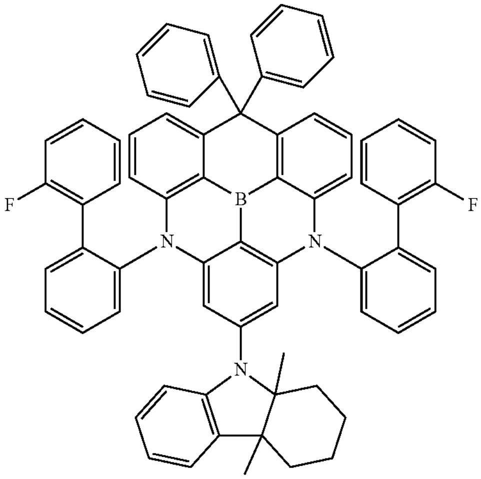
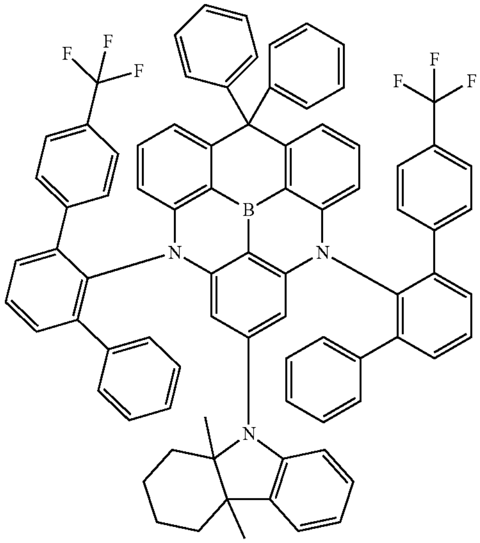

-continued
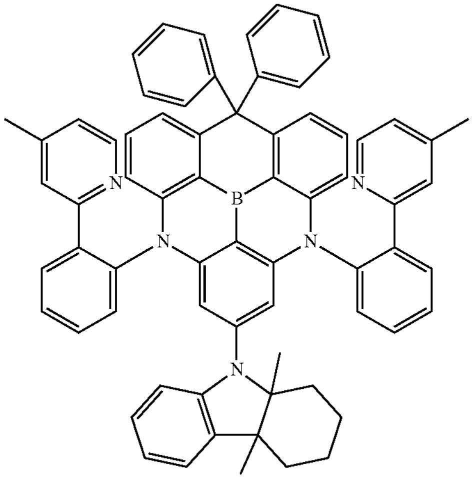
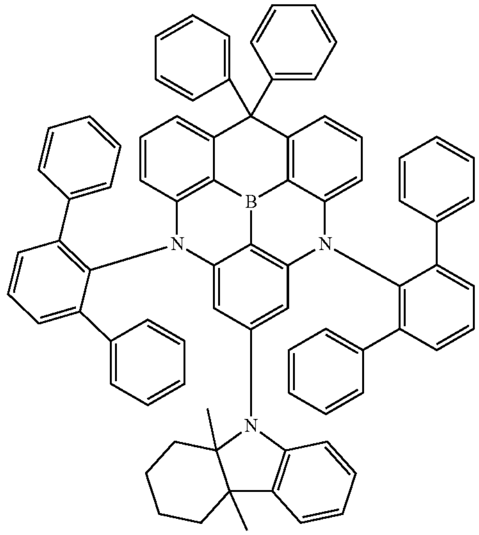
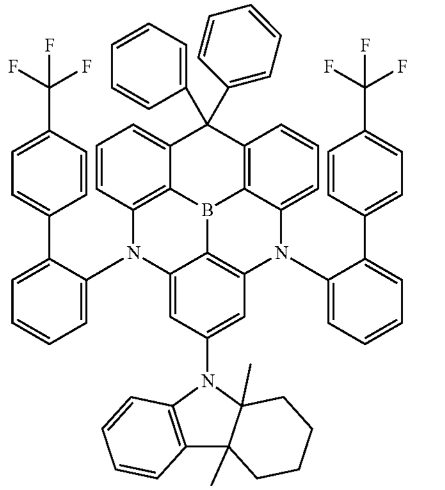
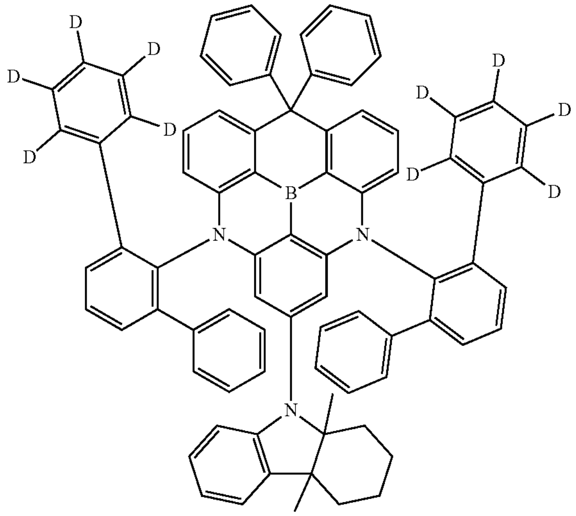
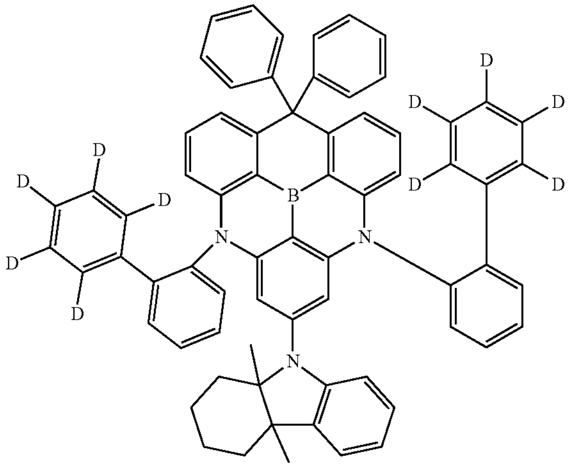
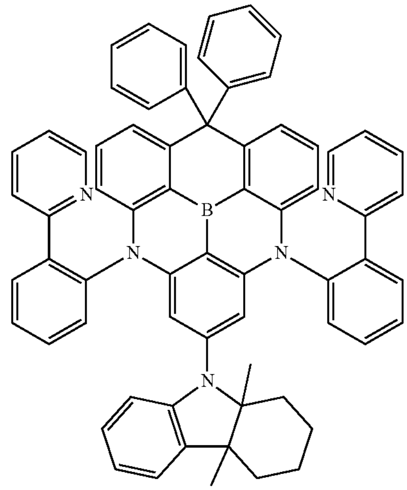
-continued -continued
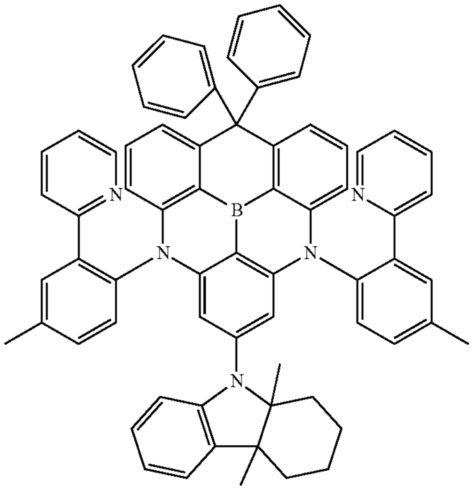
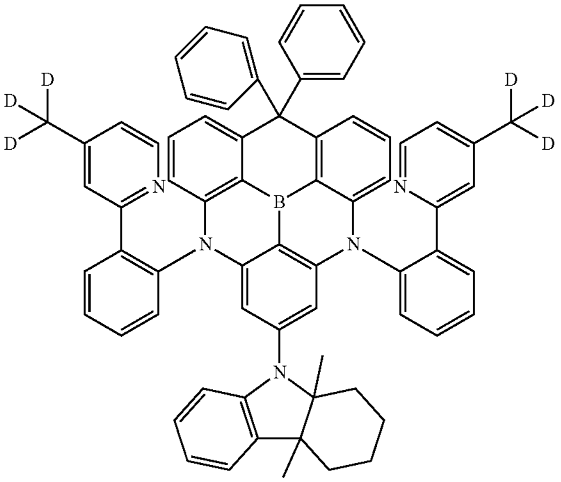
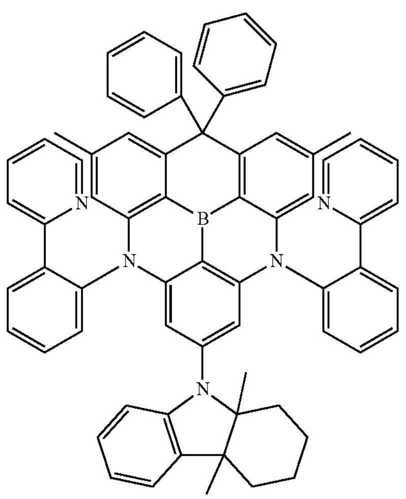
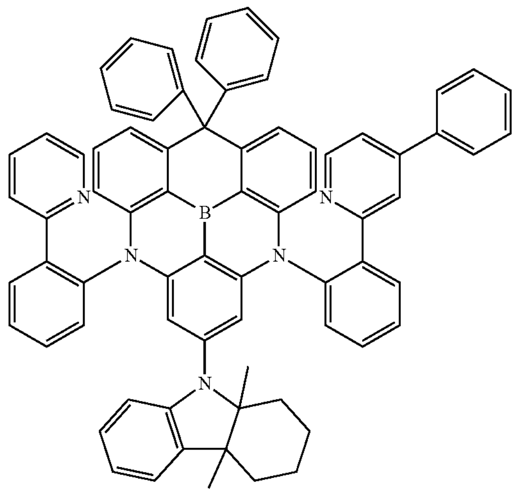
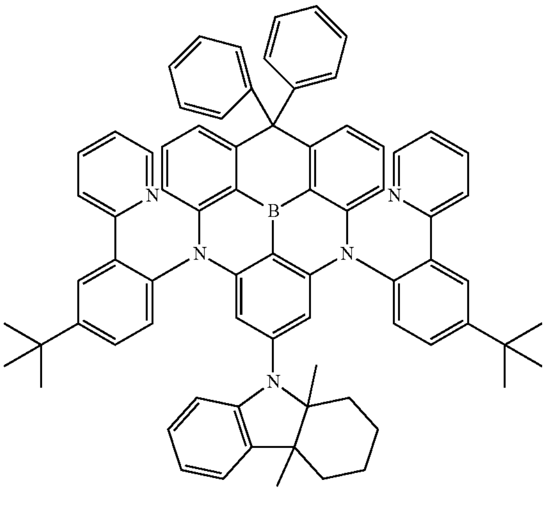
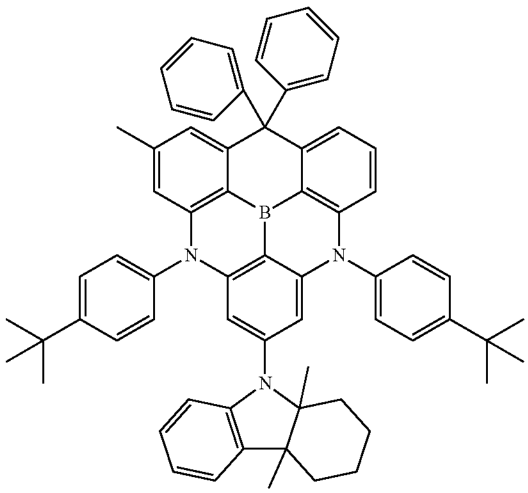
-continued -continued
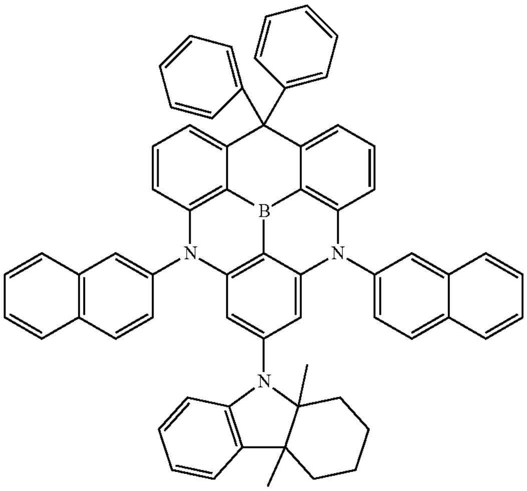
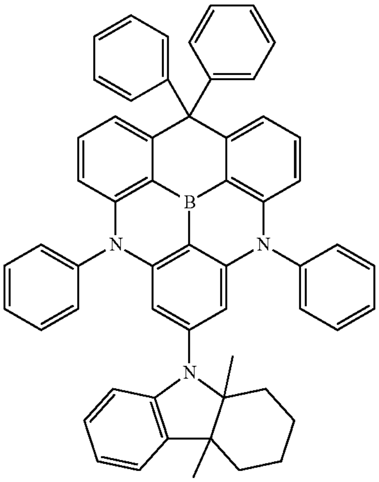
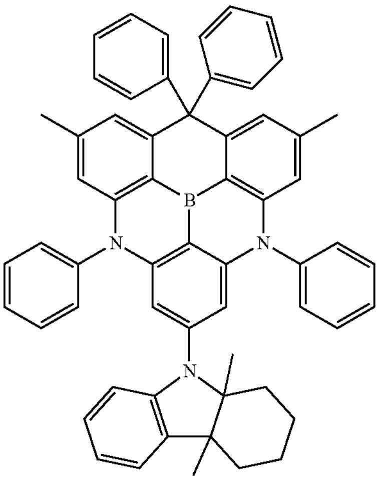
-continued
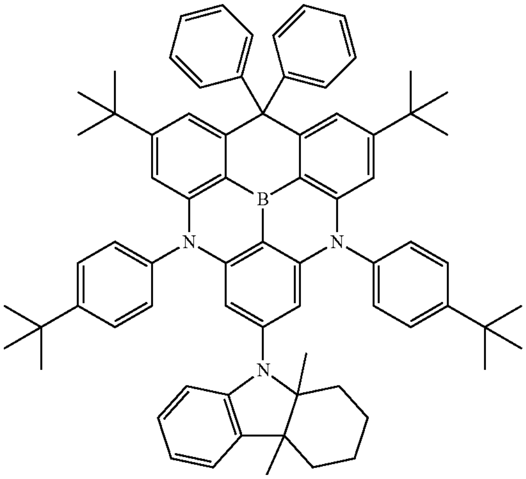
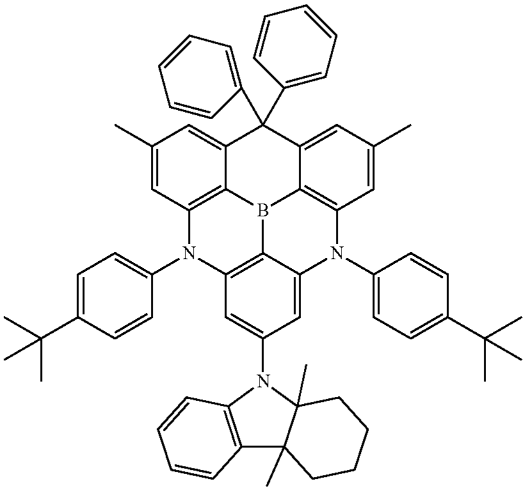
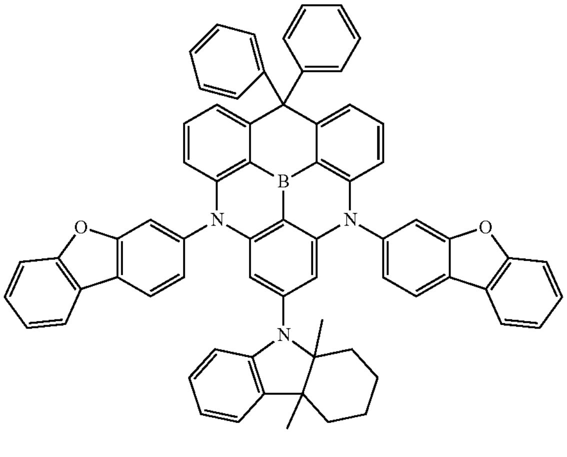

-continued
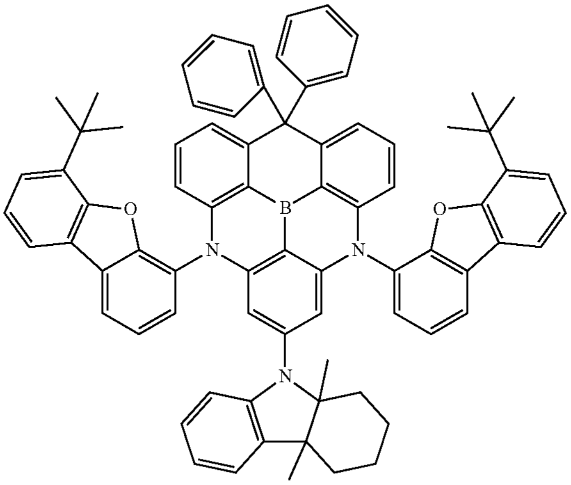
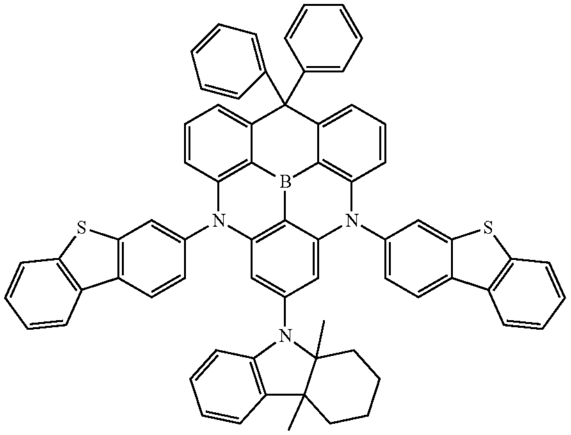
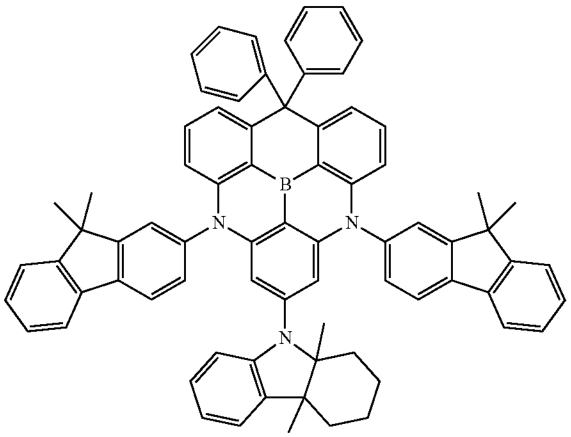
-continued
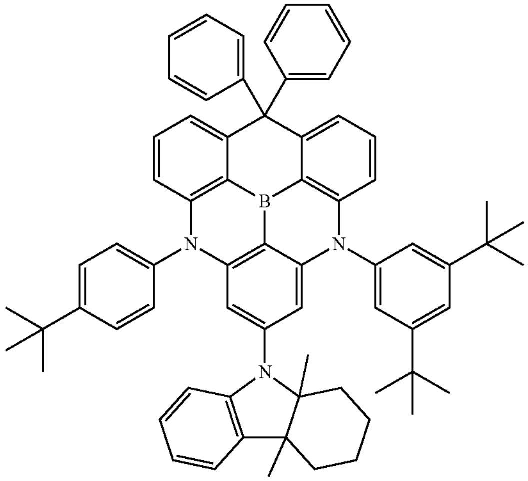
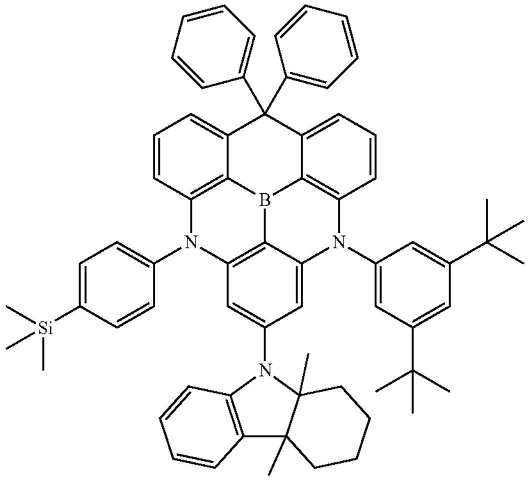
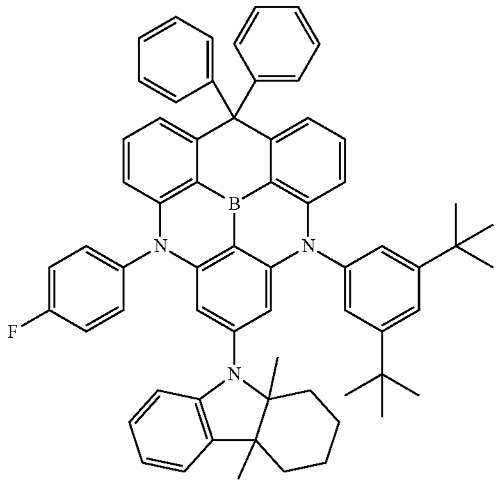

-continued
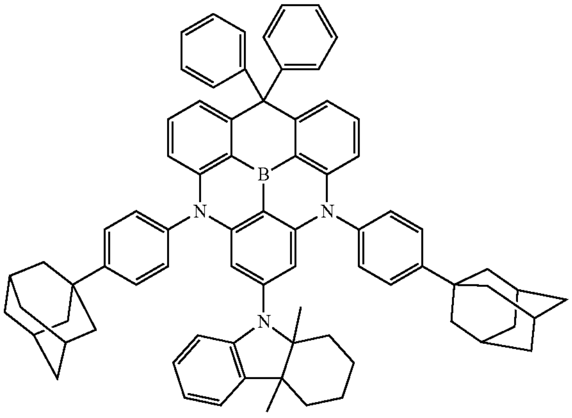
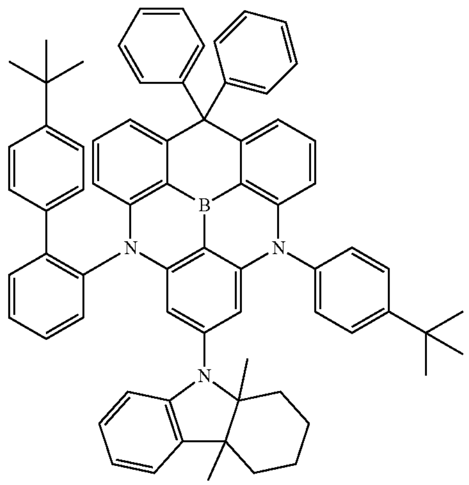
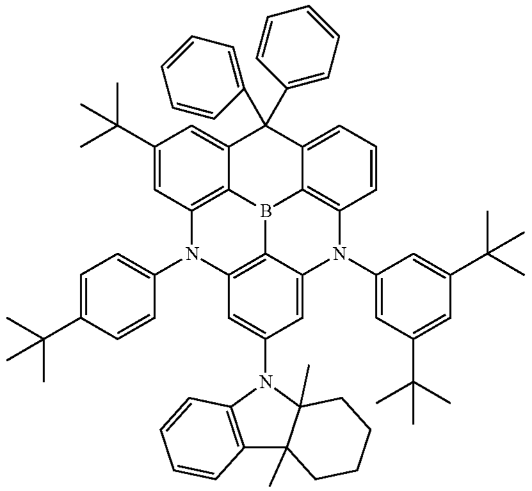
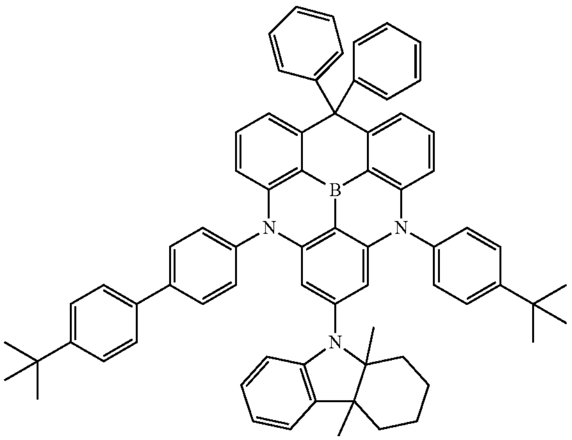
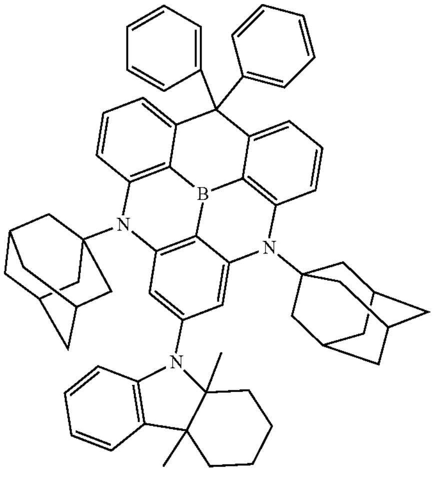
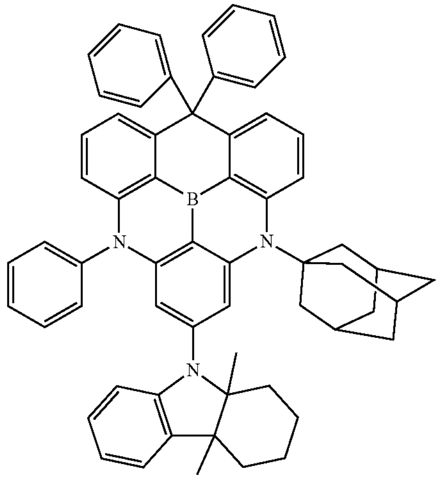
-continued -continued
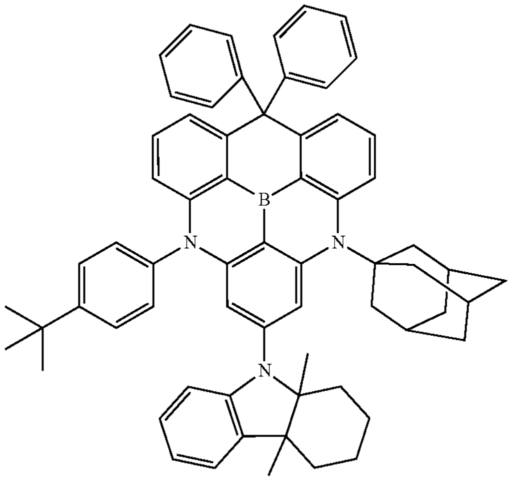
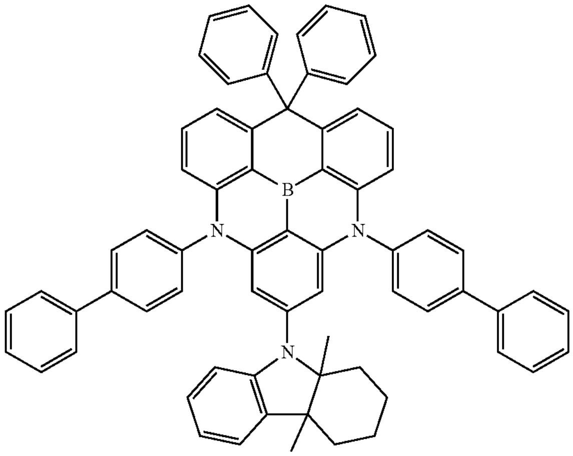
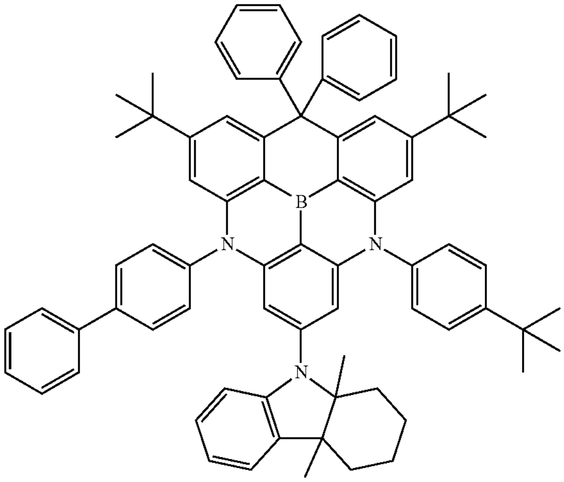
-continued
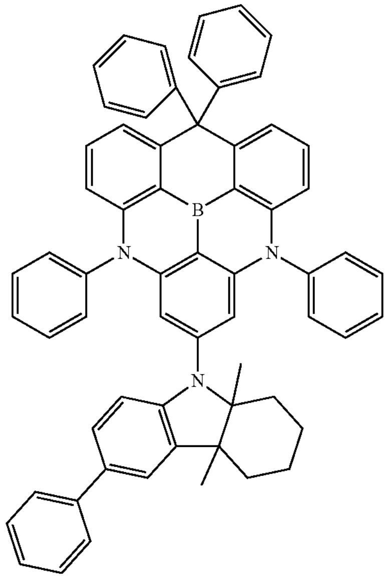
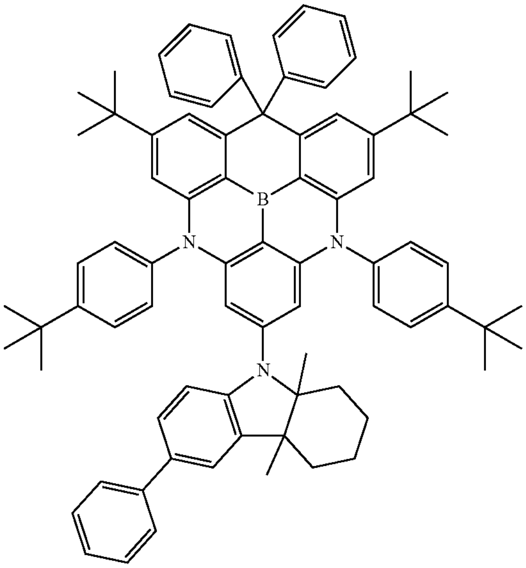
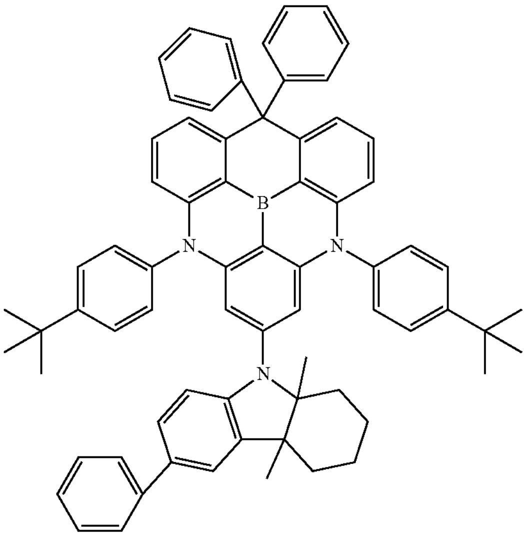

-continued
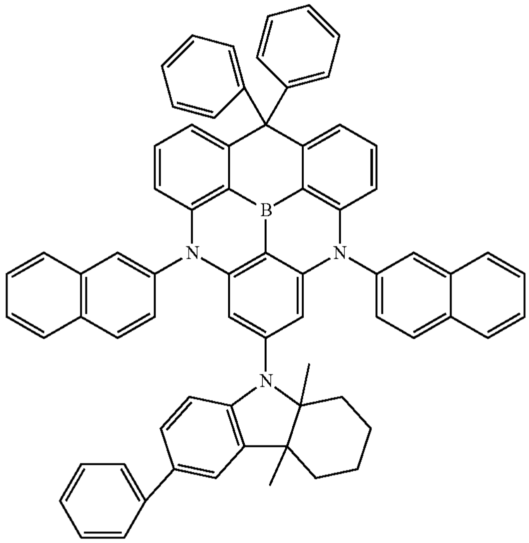
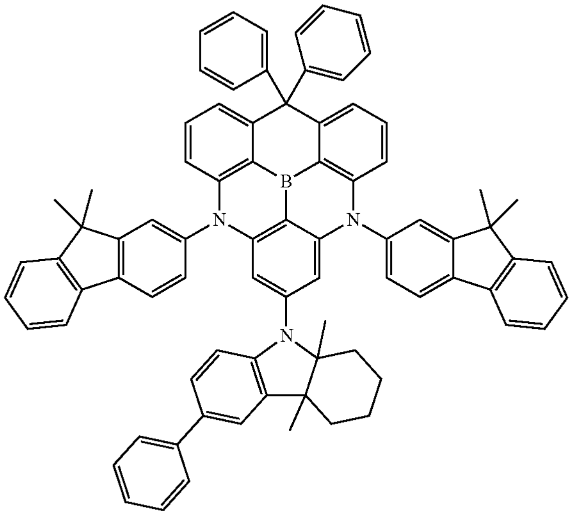
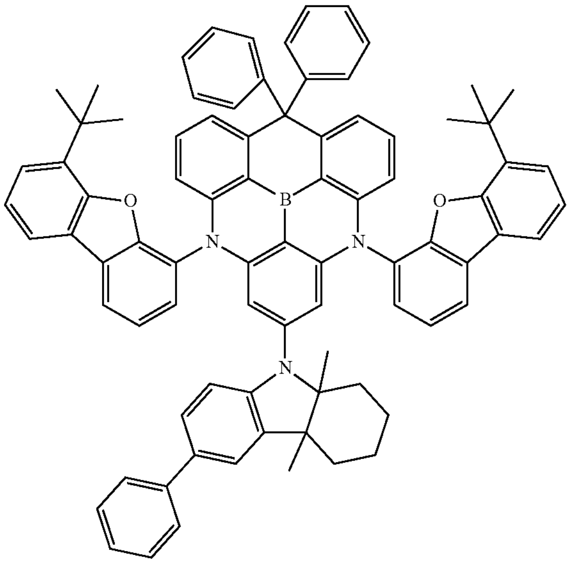
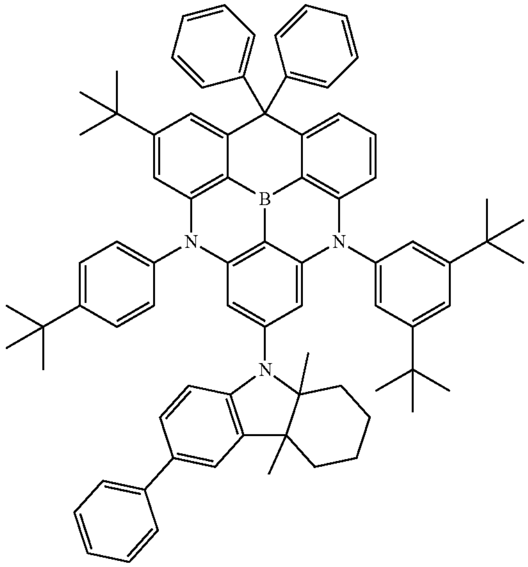
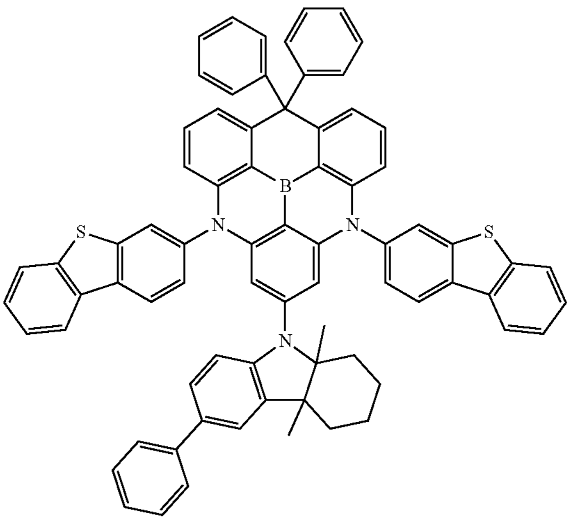
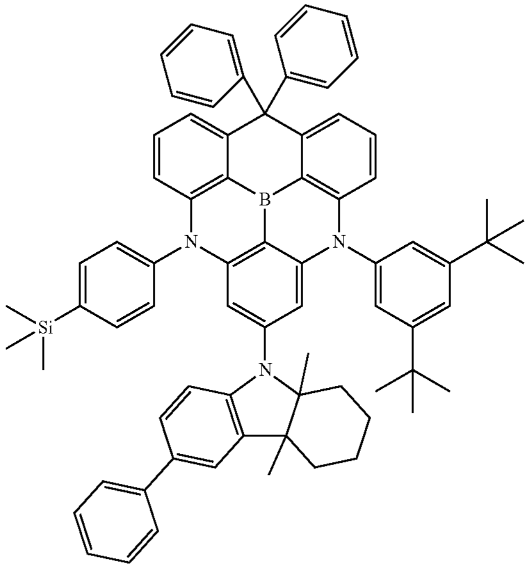
-continued -continued
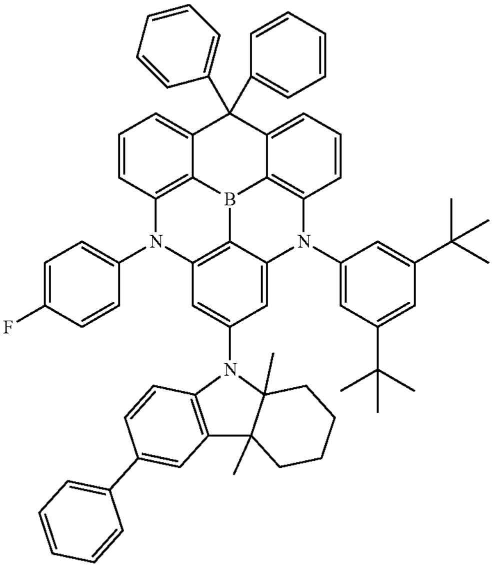
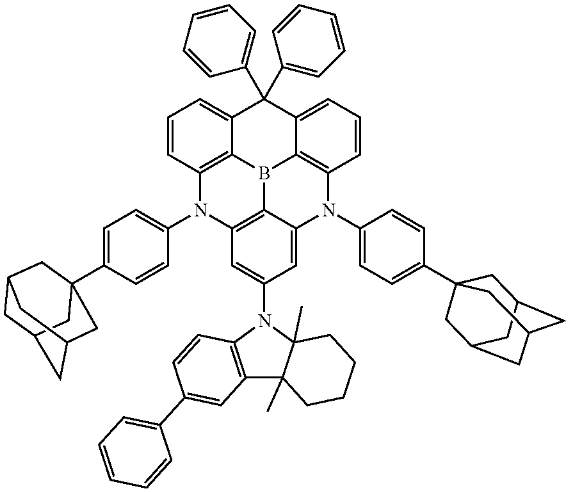
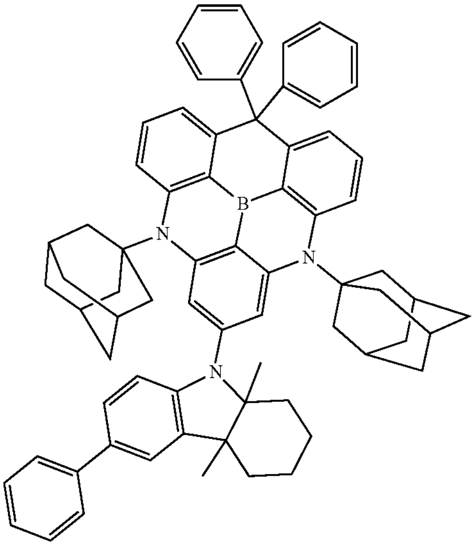
-continued
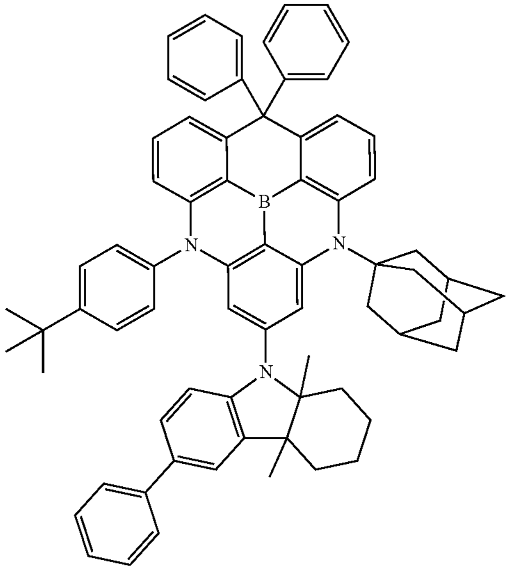
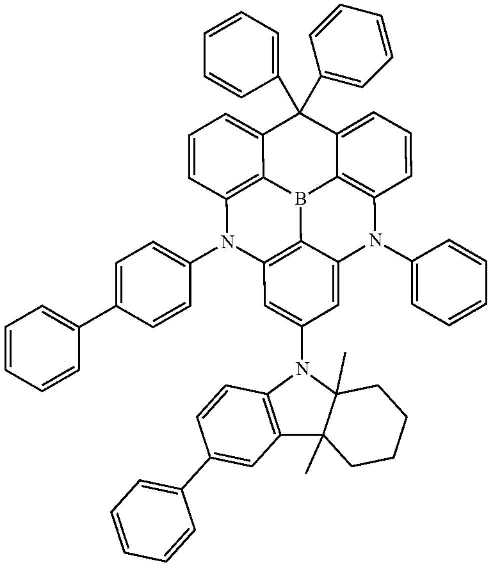
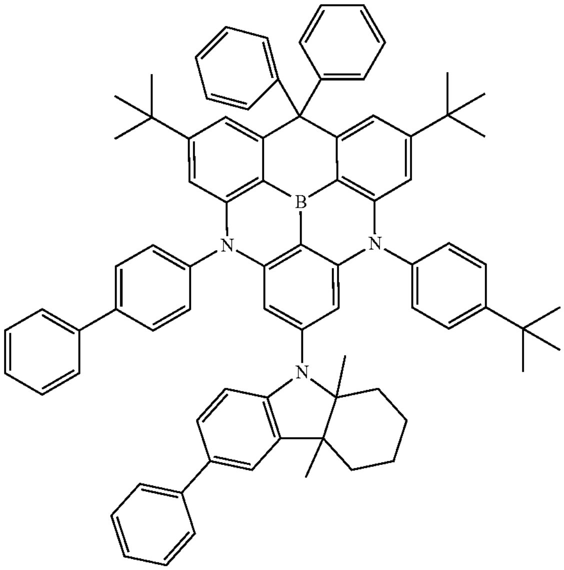

-continued
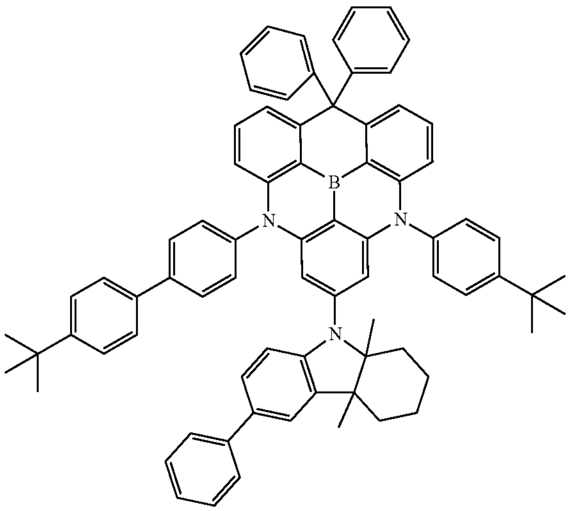
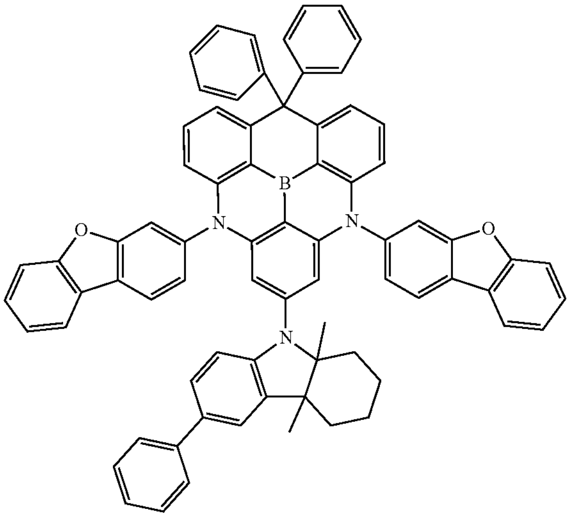
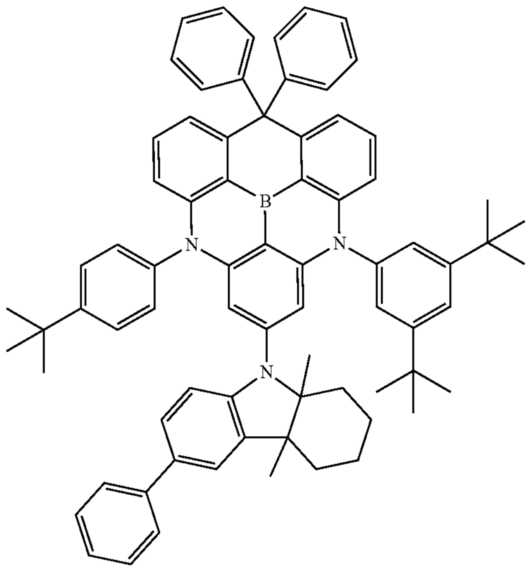
-continued
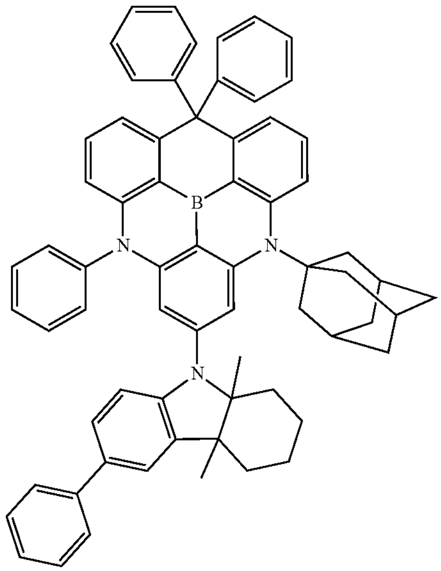
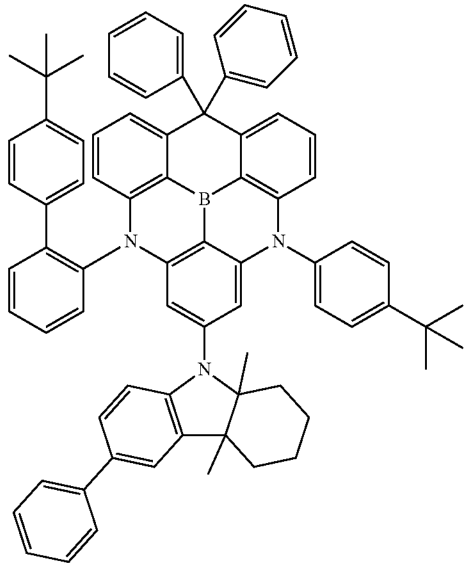

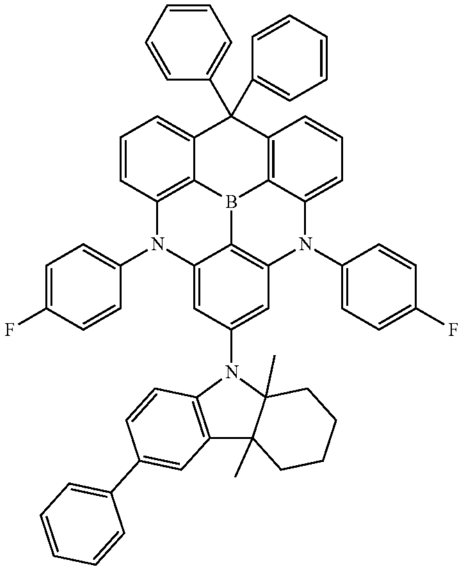
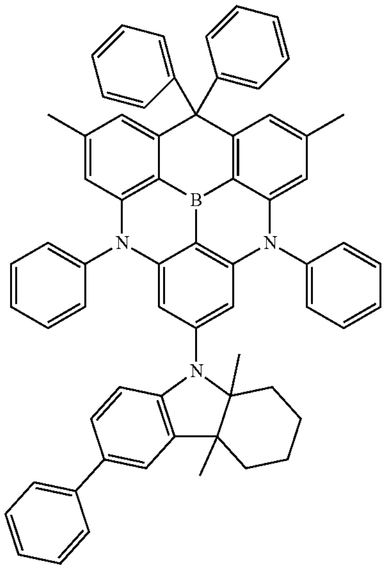
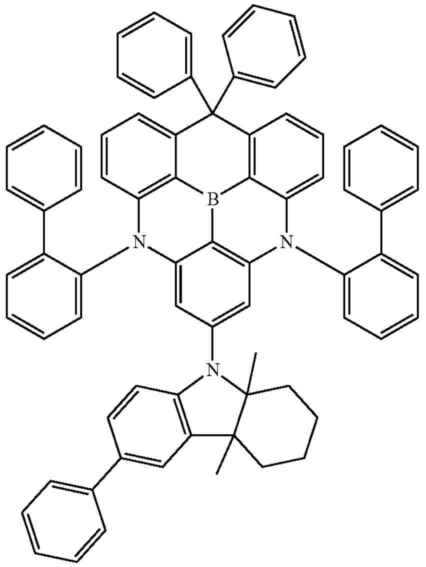
-continued
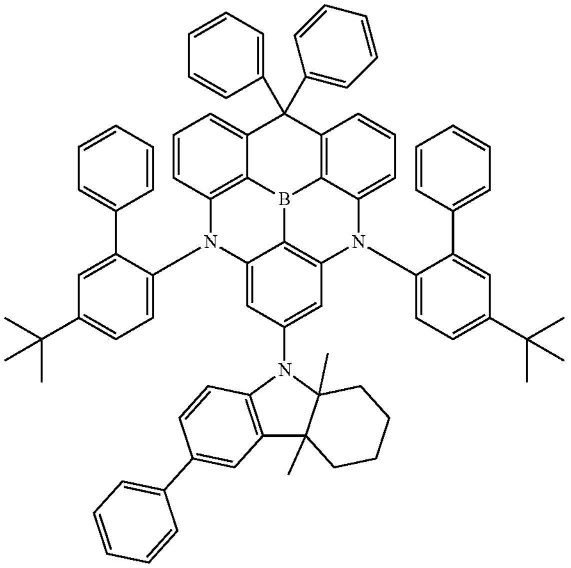
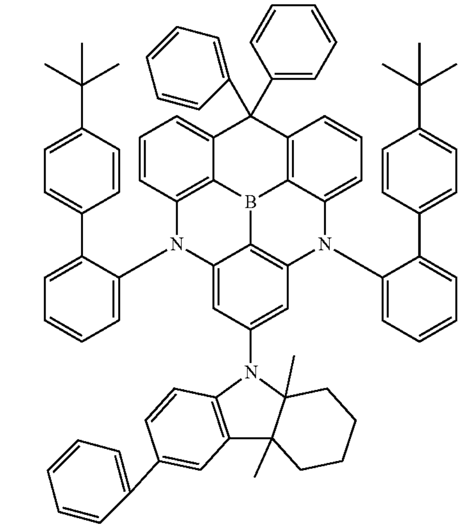
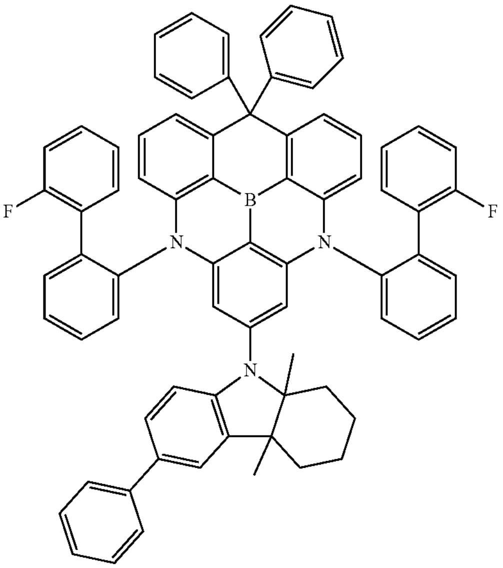

-continued
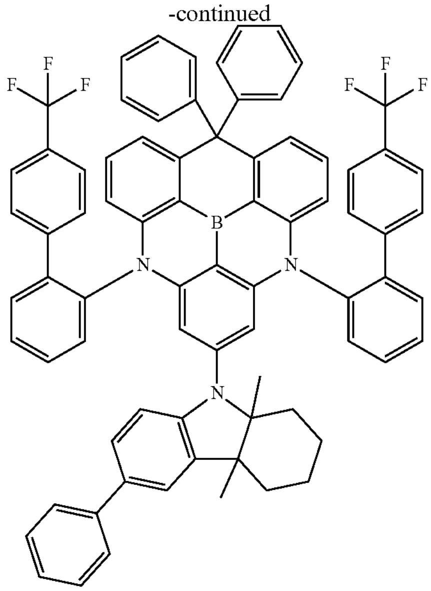
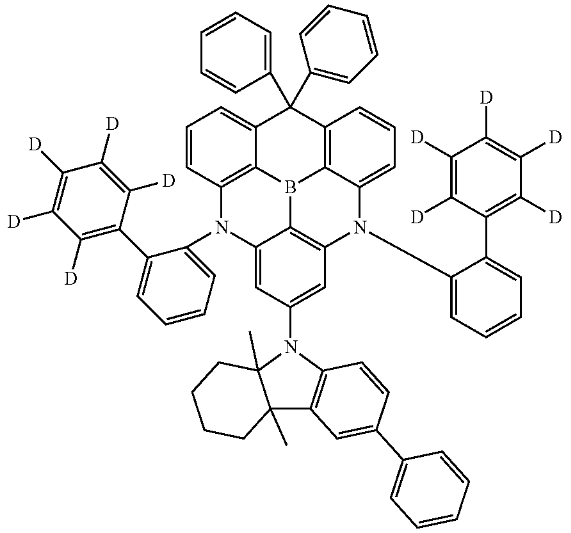
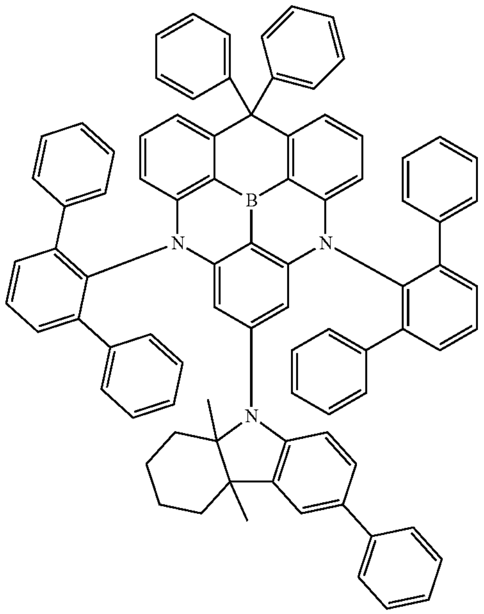
-continued
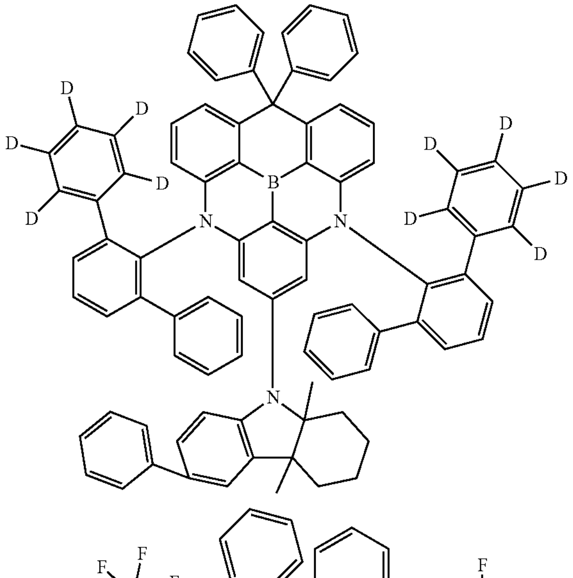
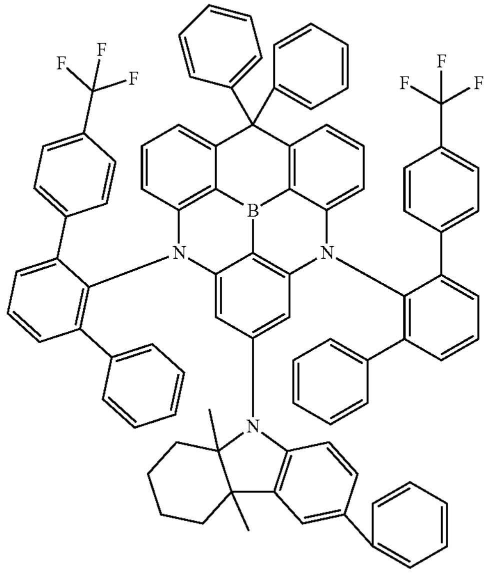
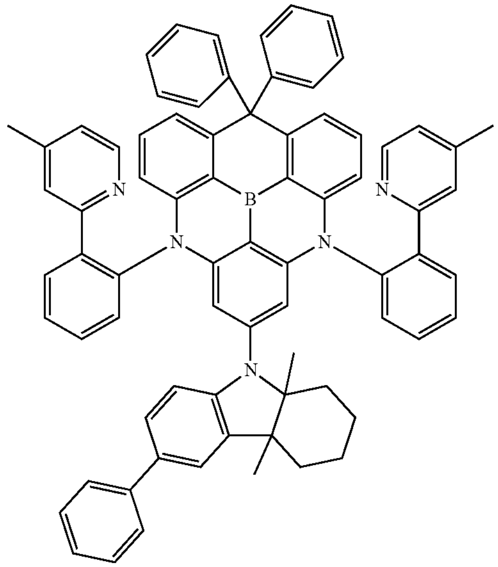

-continued
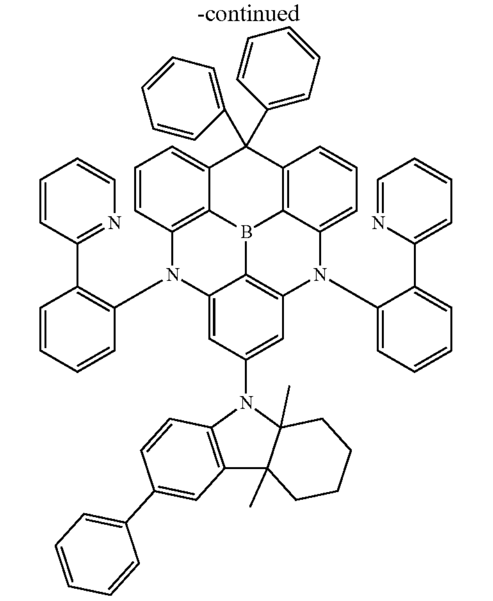
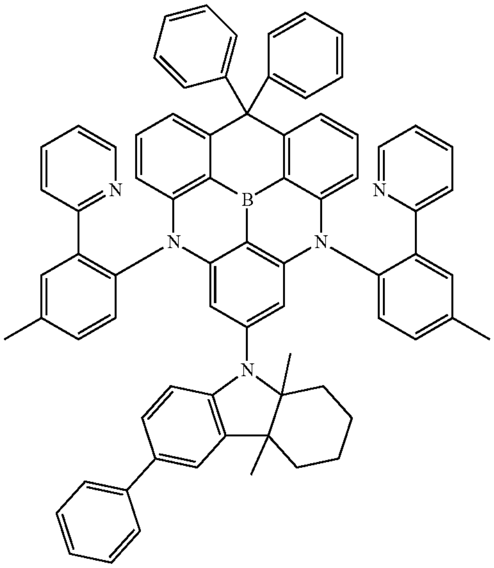
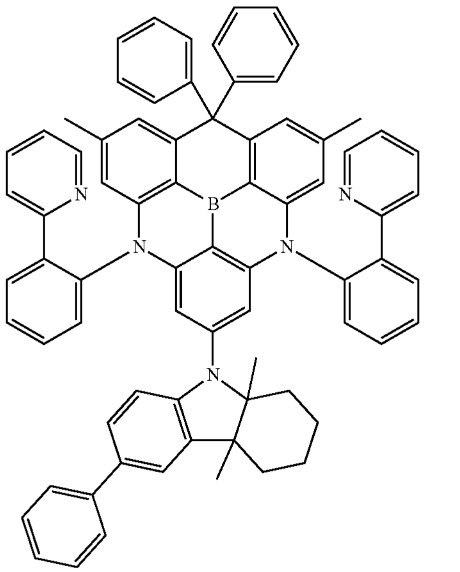
-continued
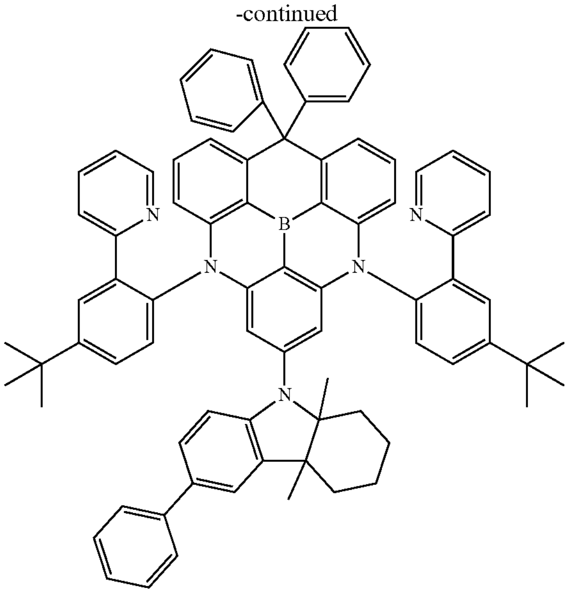
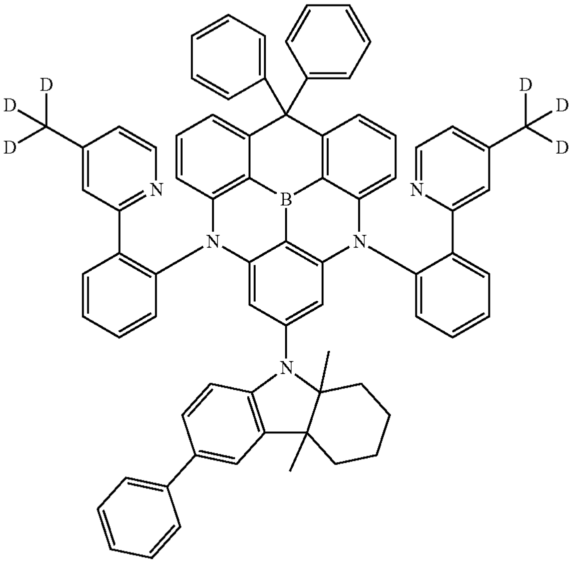
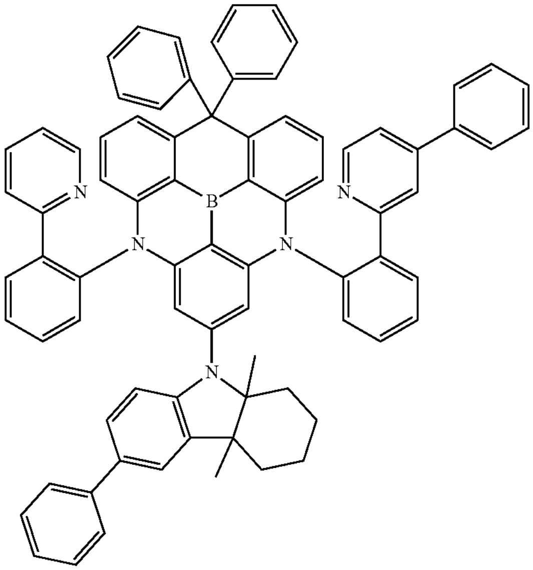

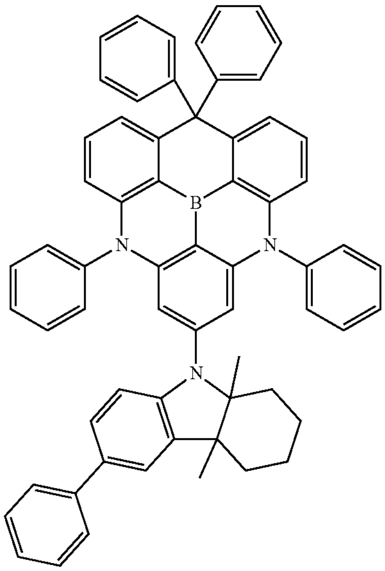
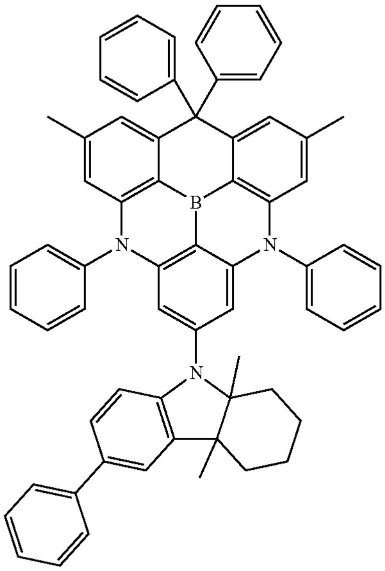
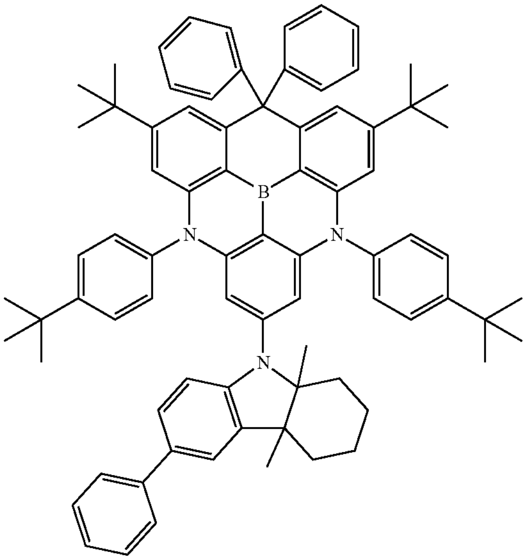
-continued
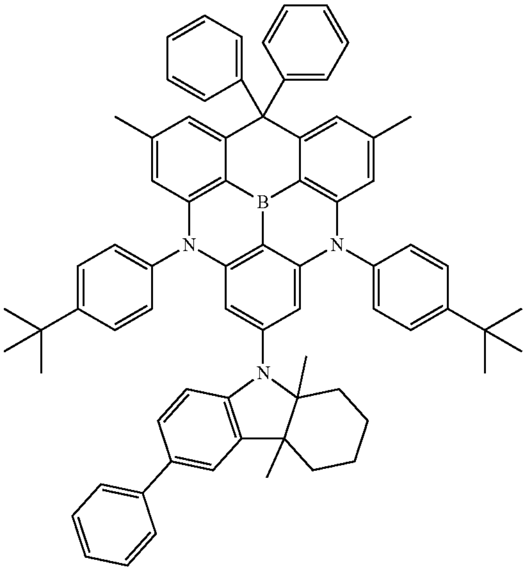
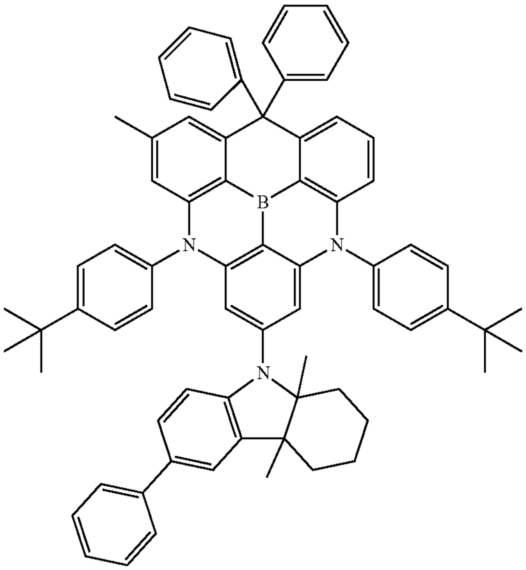
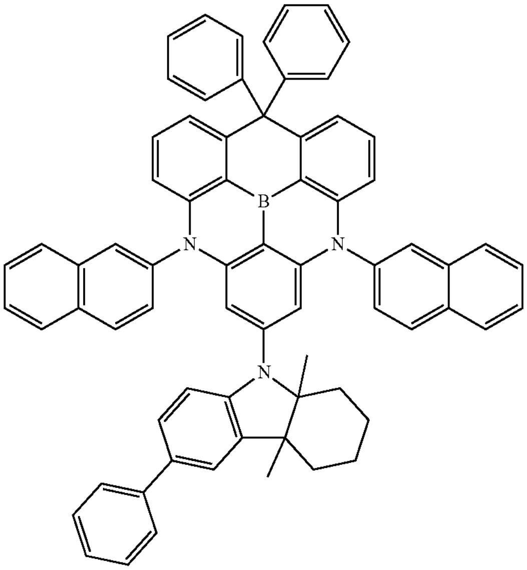

-continued
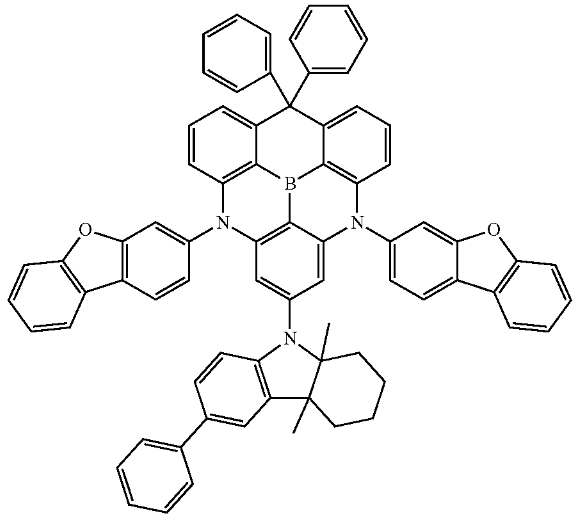
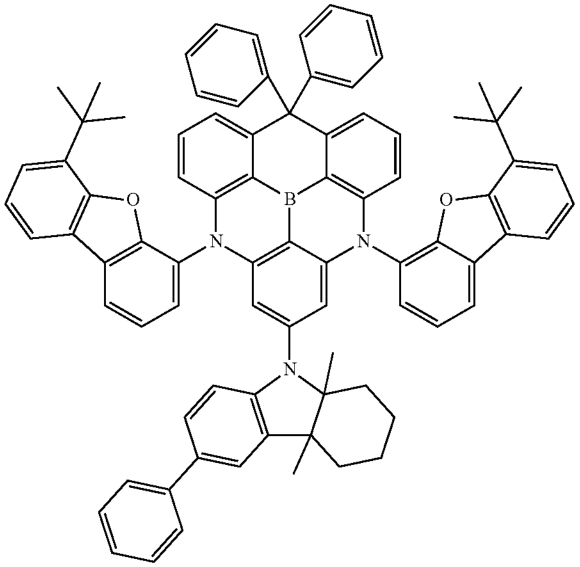
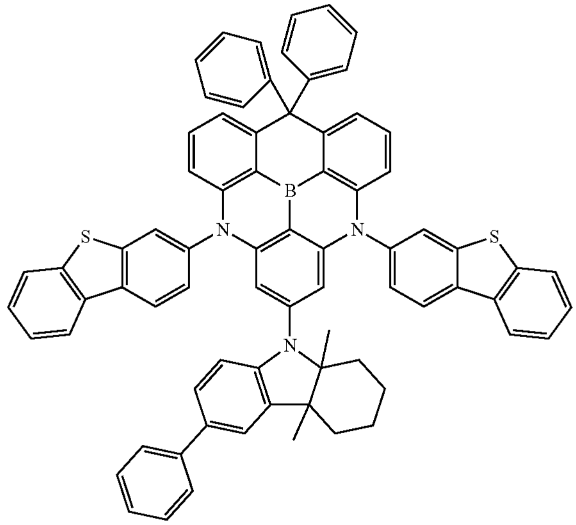
-continued
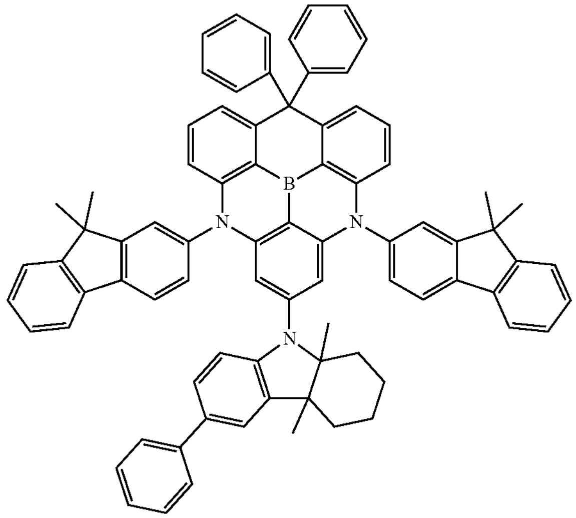
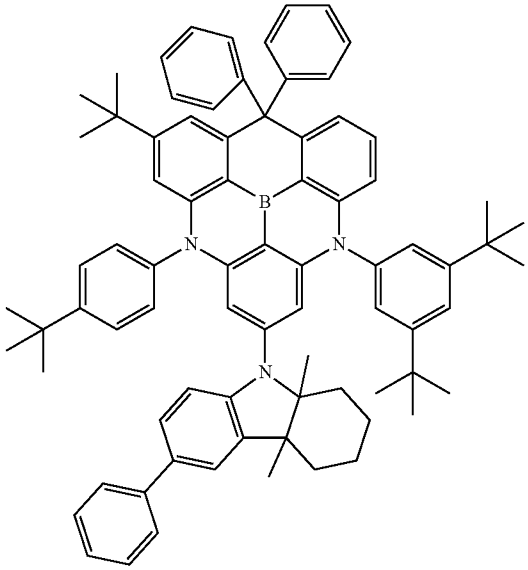
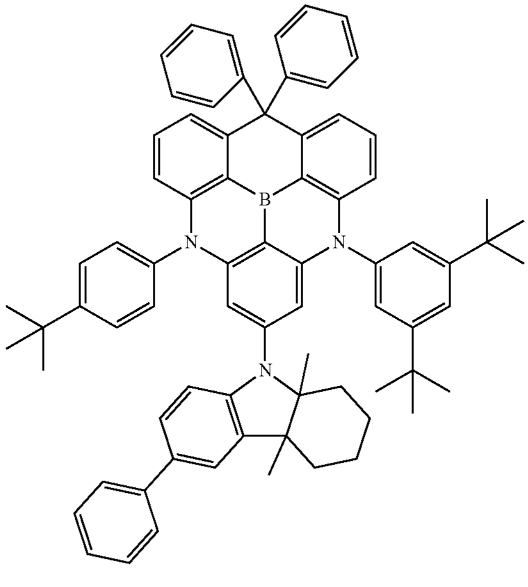

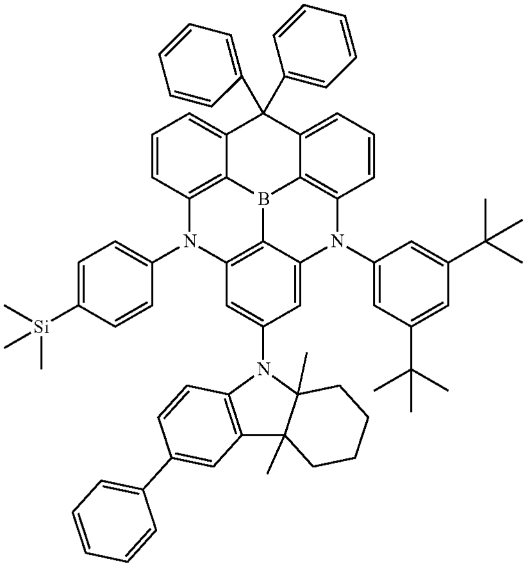
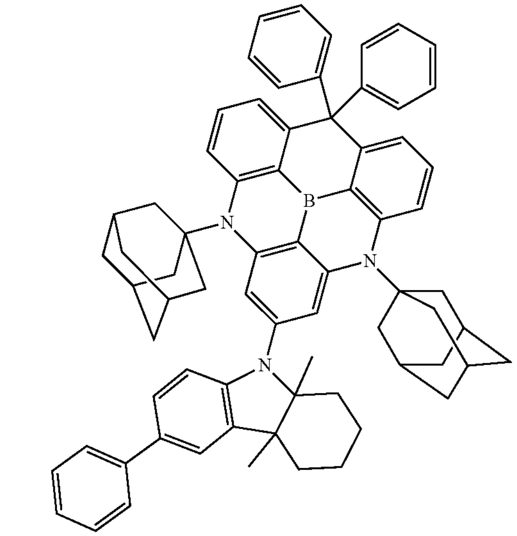
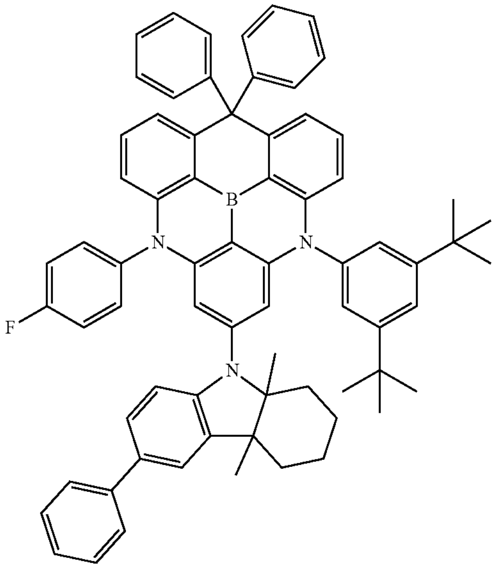
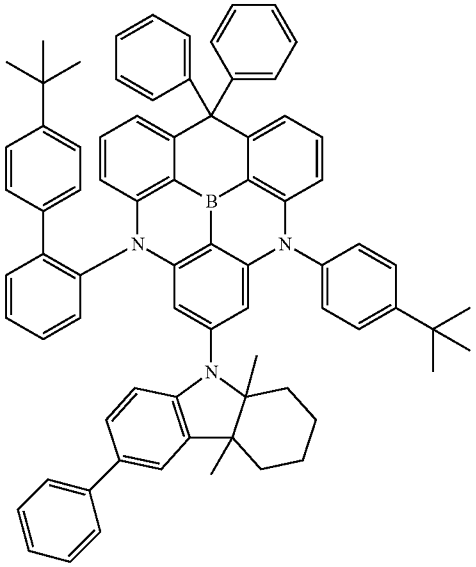
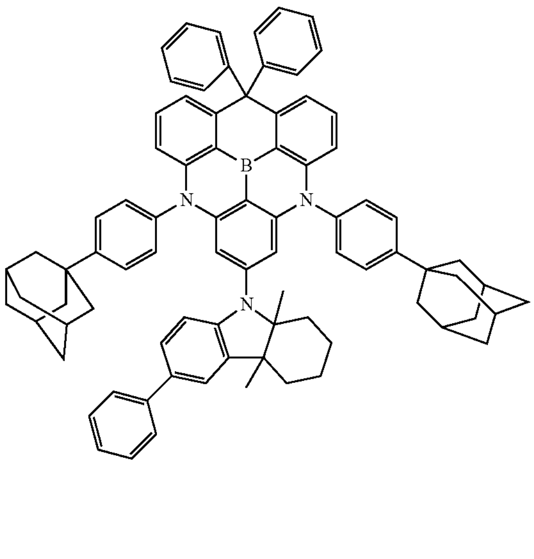
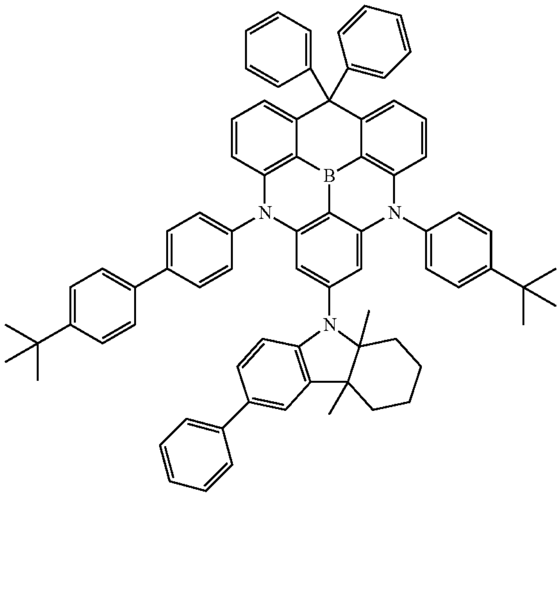

-continued
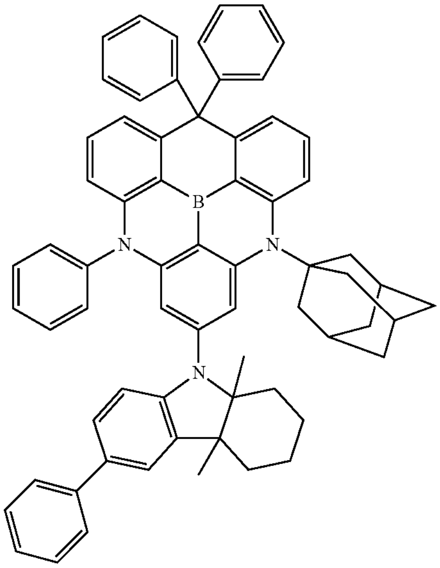
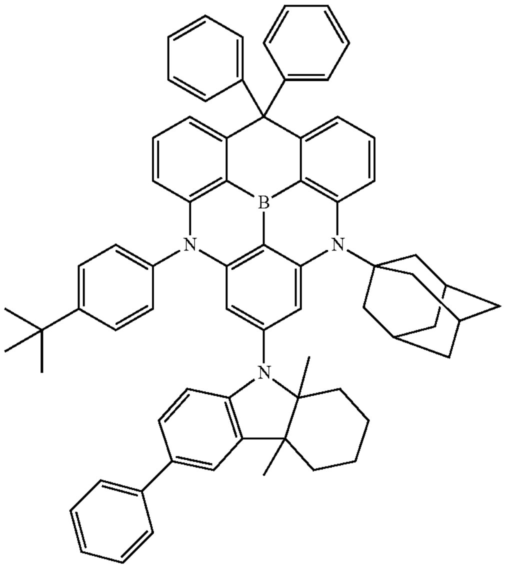
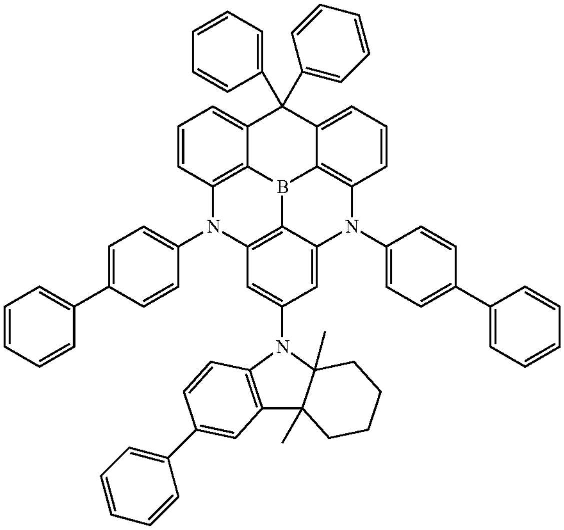
-continued
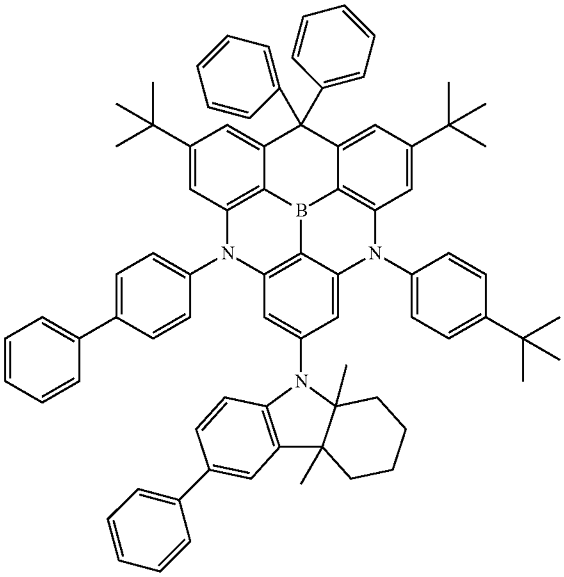
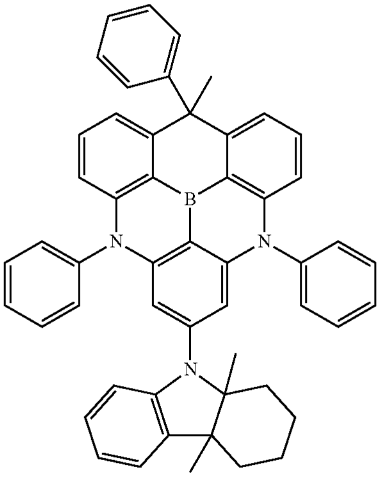
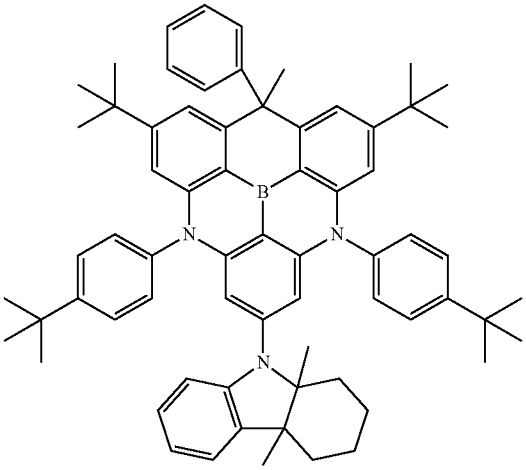

-continued
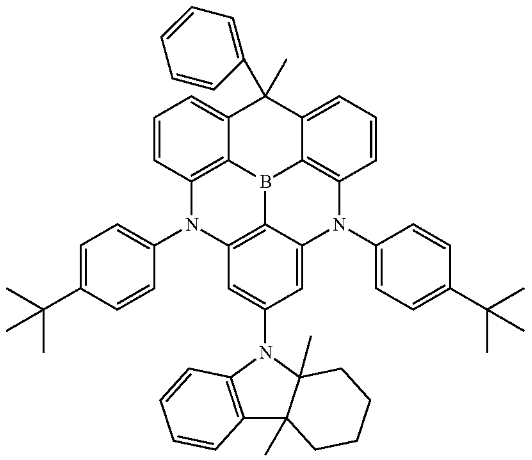
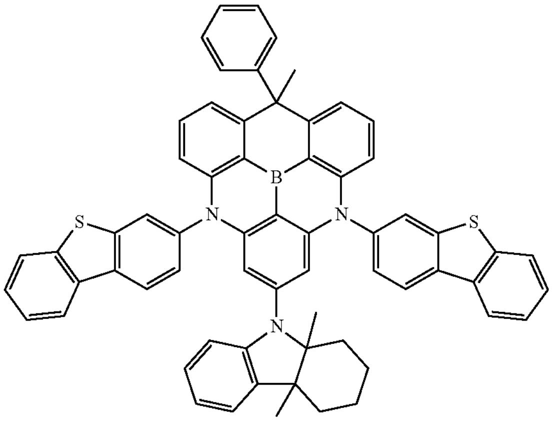
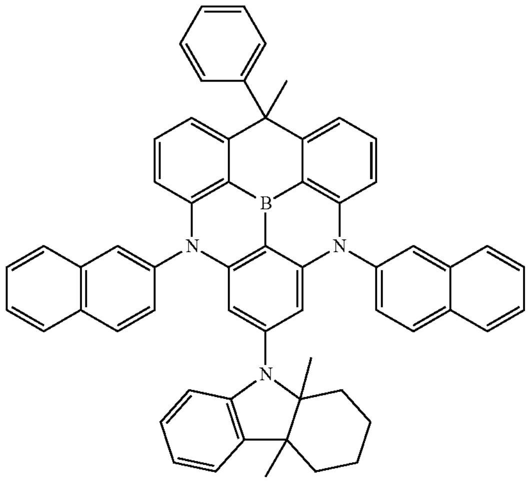
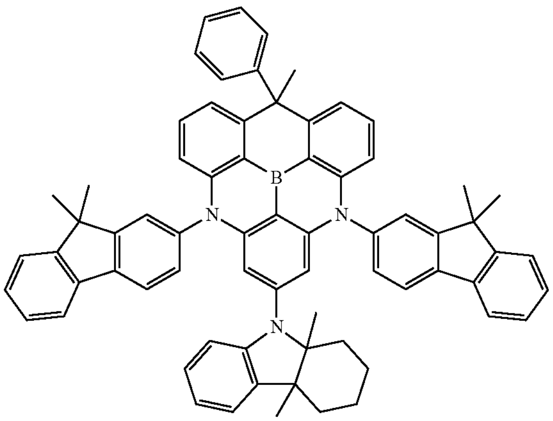
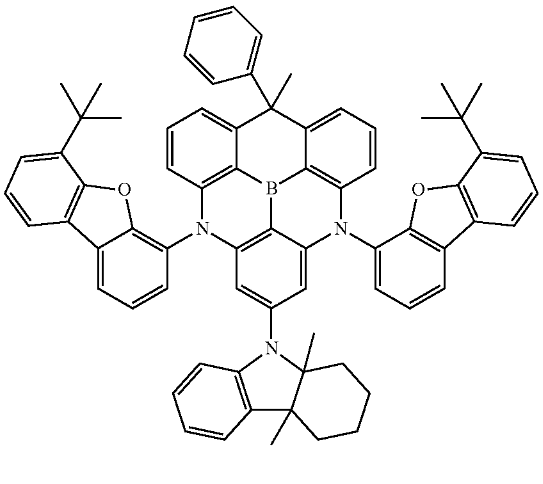
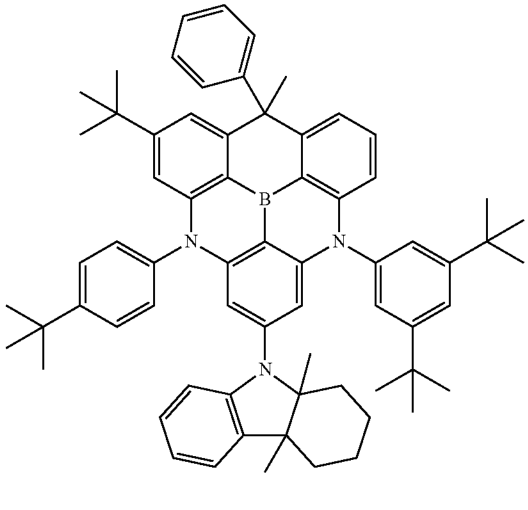
-continued -continued
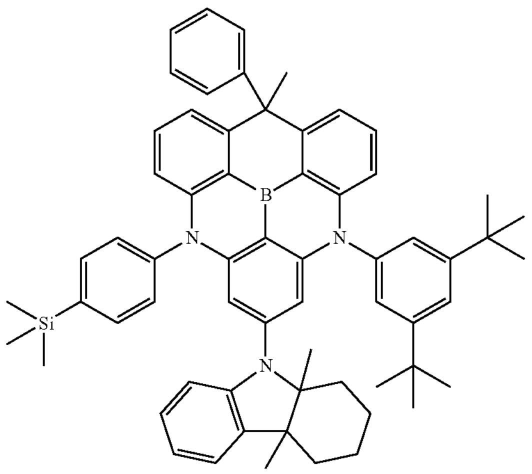
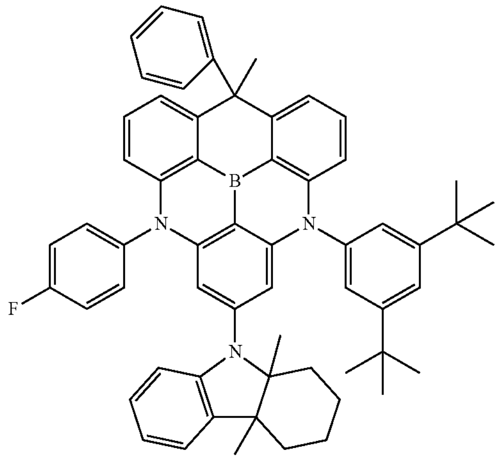
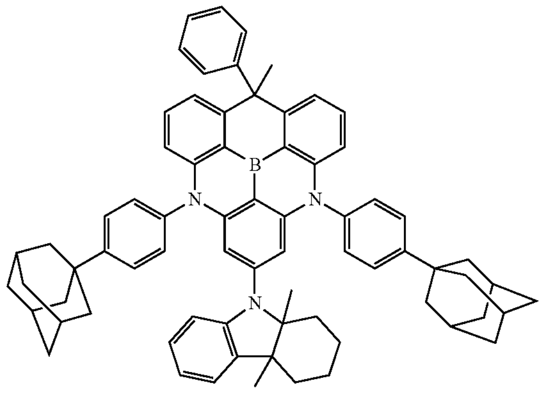
-continued
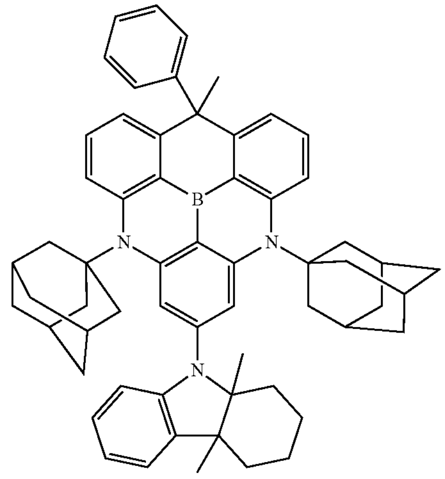
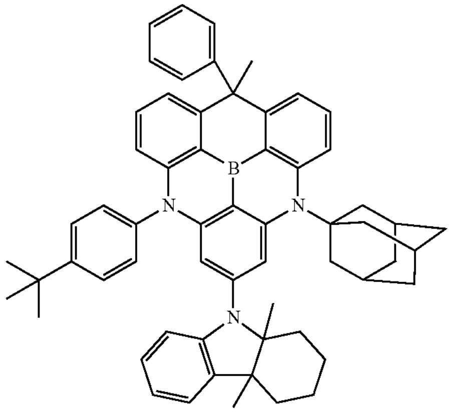
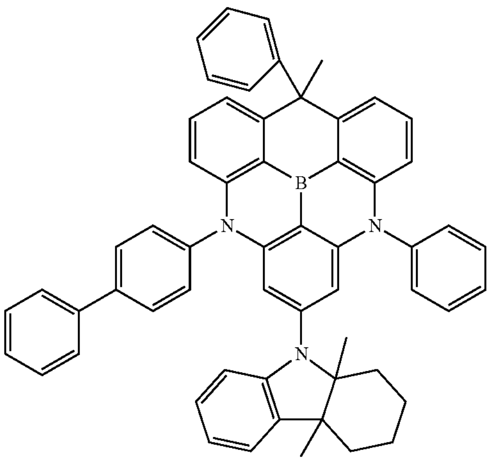

-continued
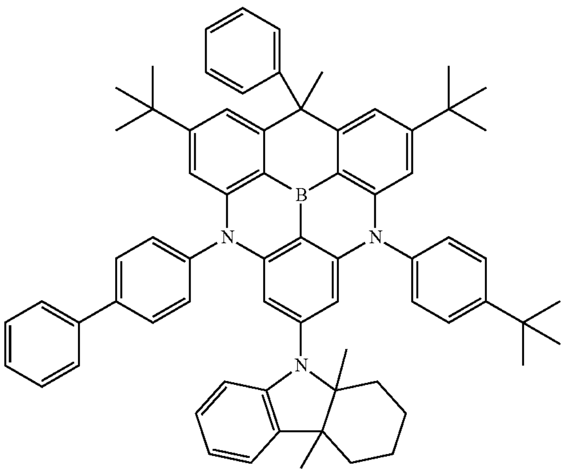
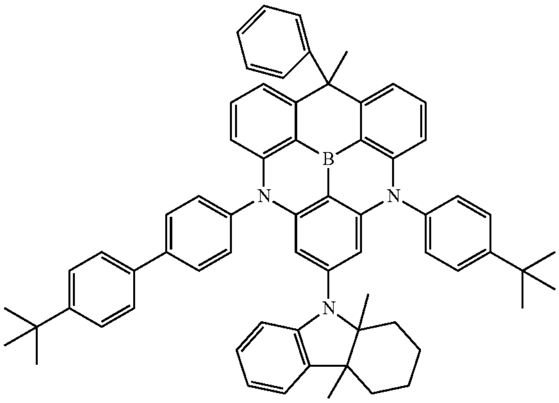
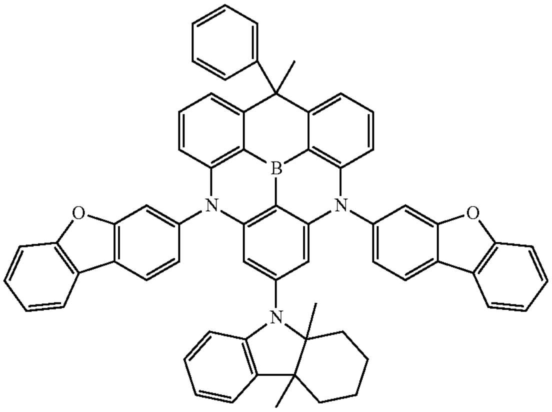
-continued
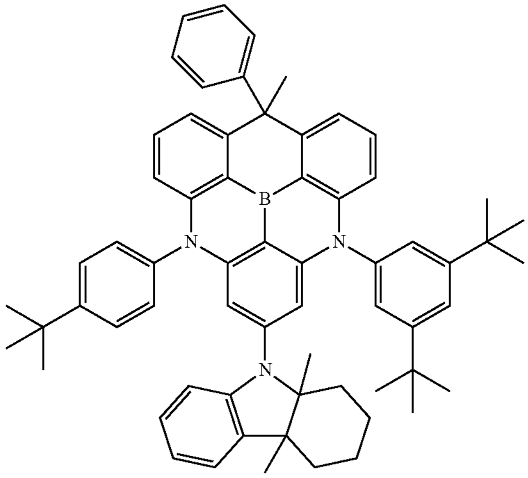
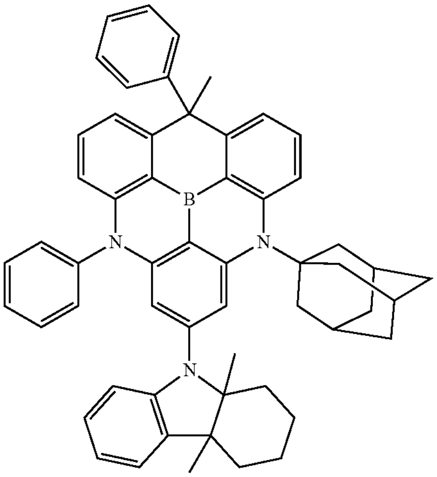
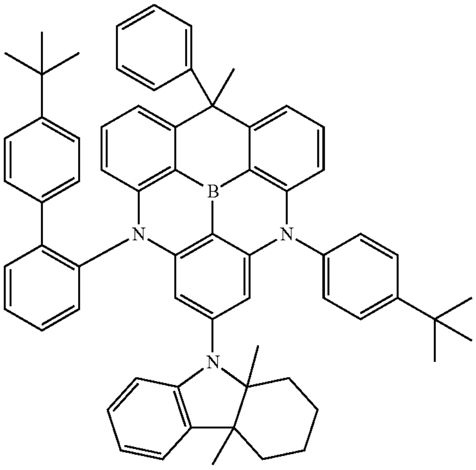

-continued
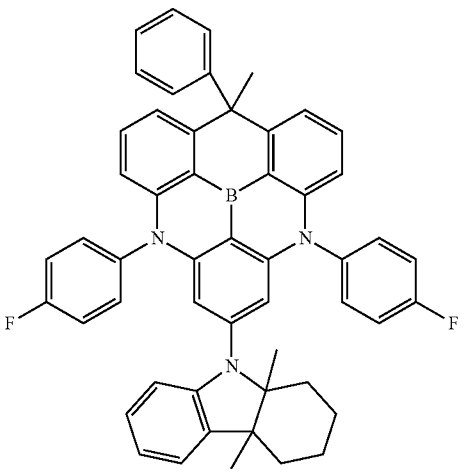
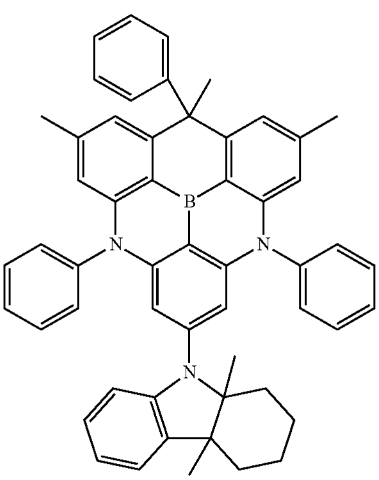
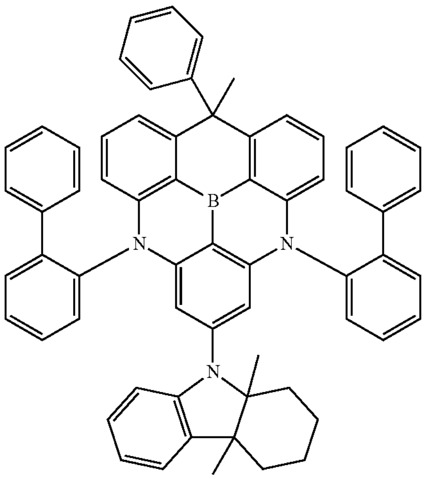
-continued
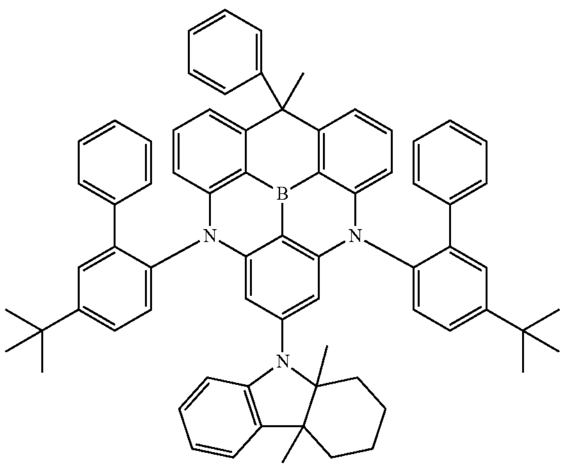
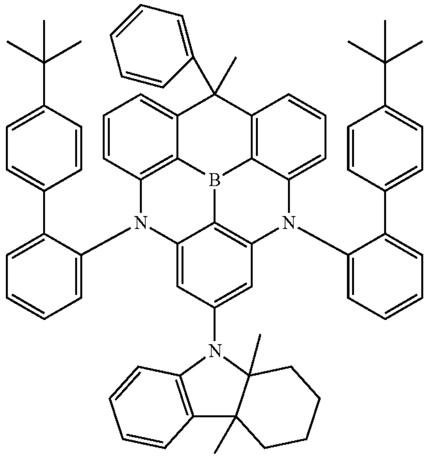
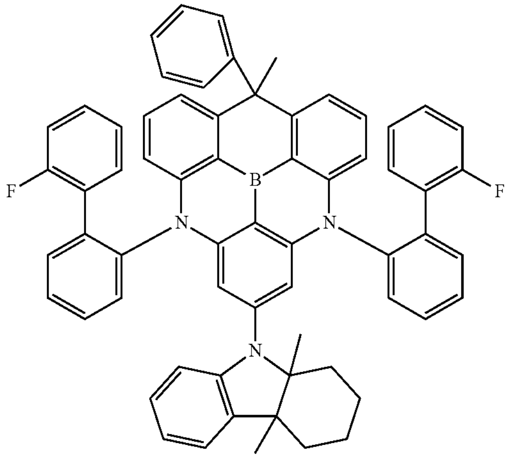

-continued
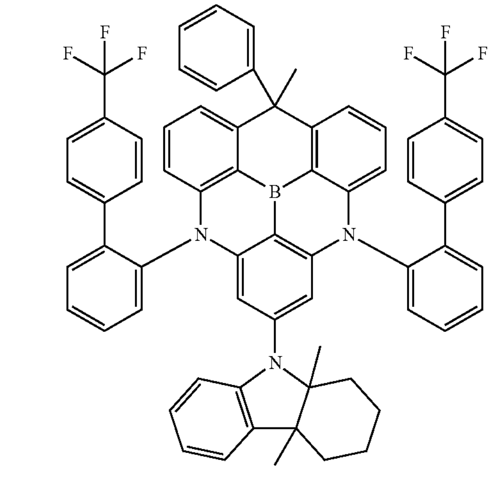
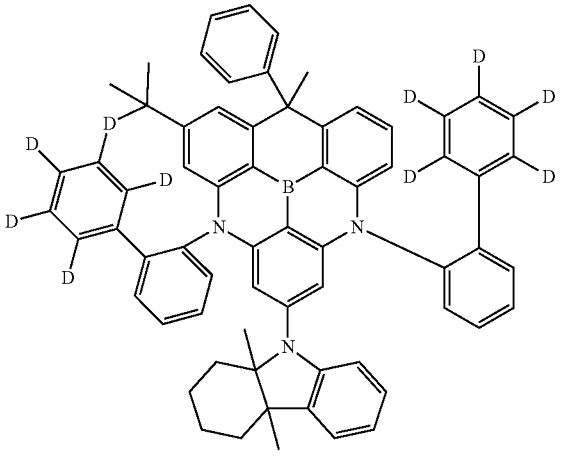
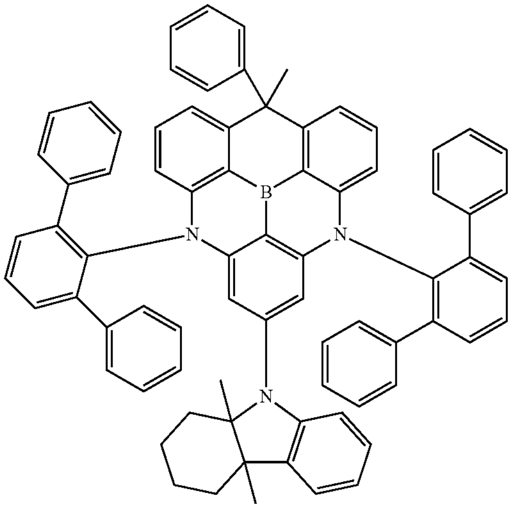
-continued
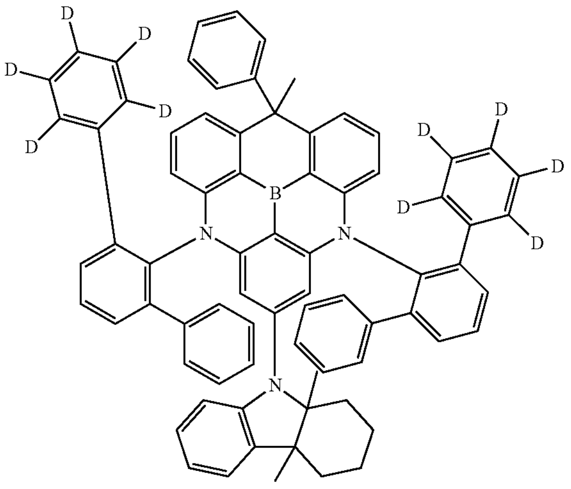
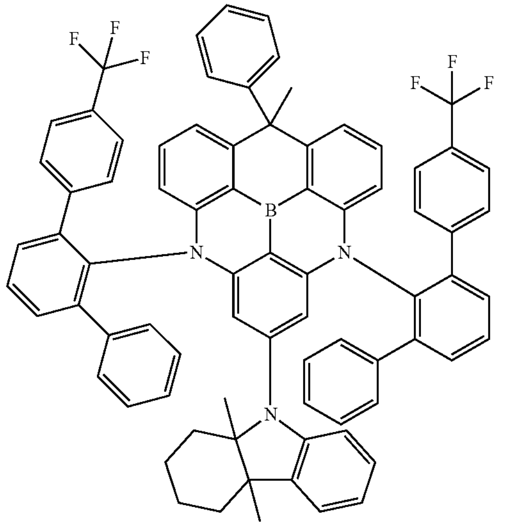
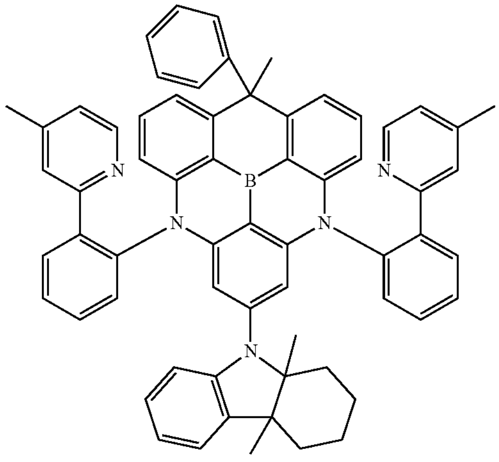

-continued
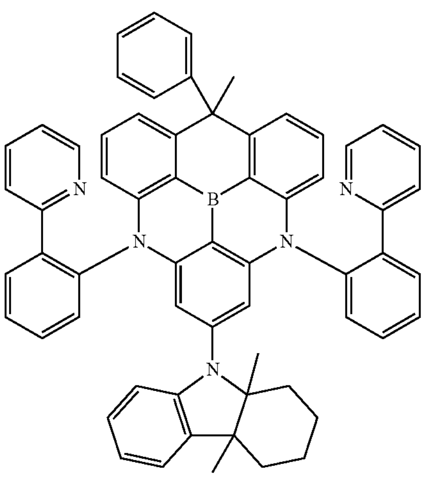
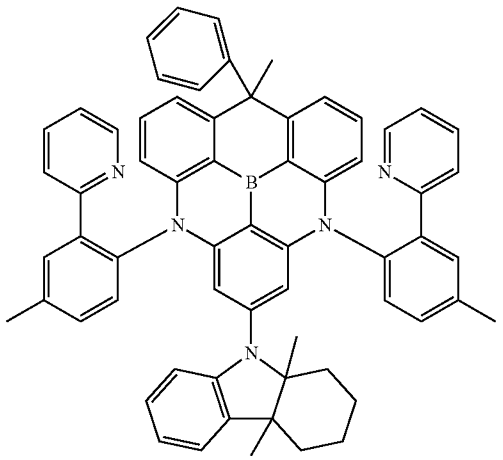
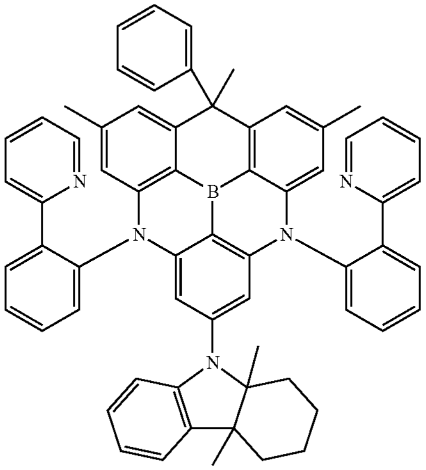
-continued
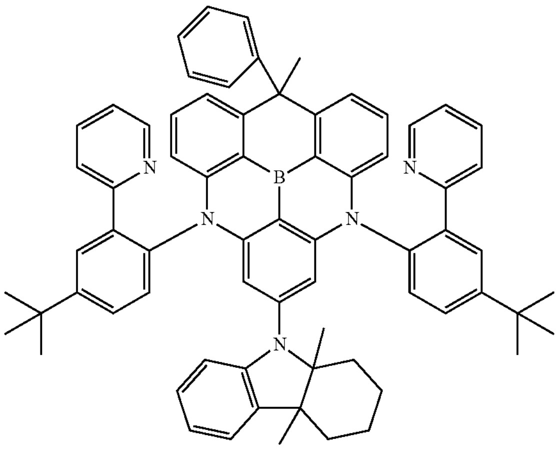
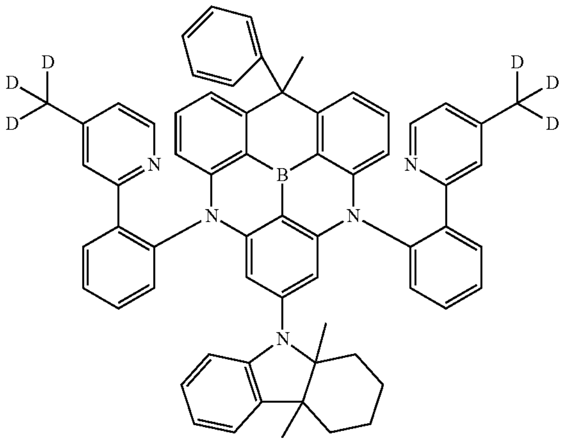
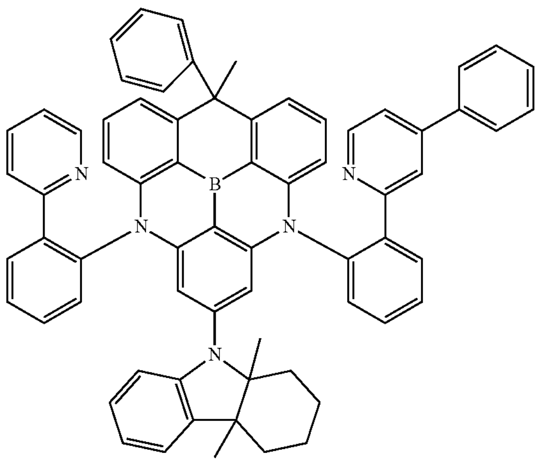

-continued
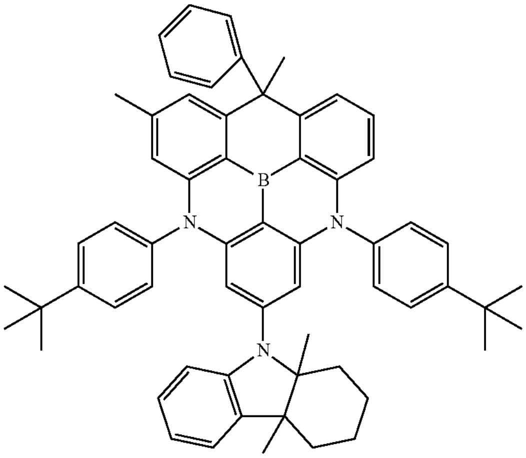
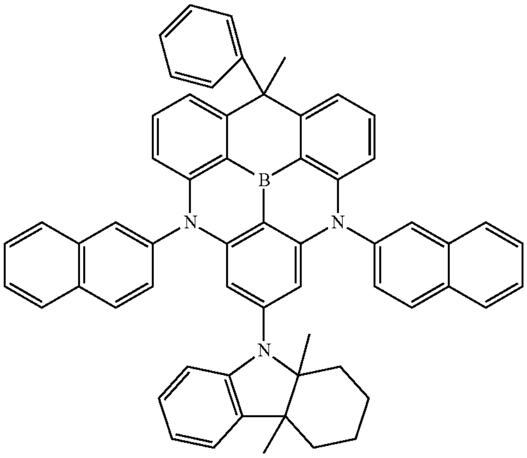
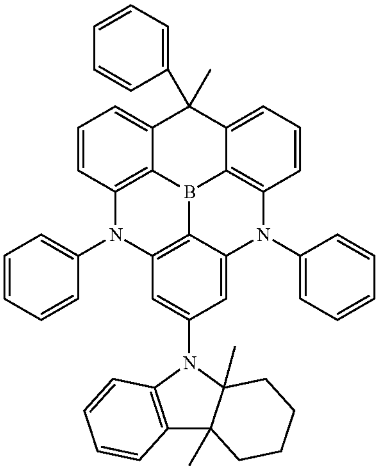
-continued
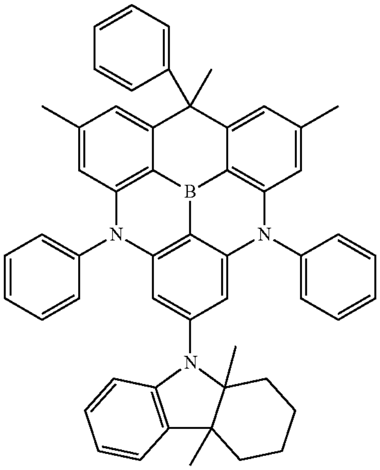
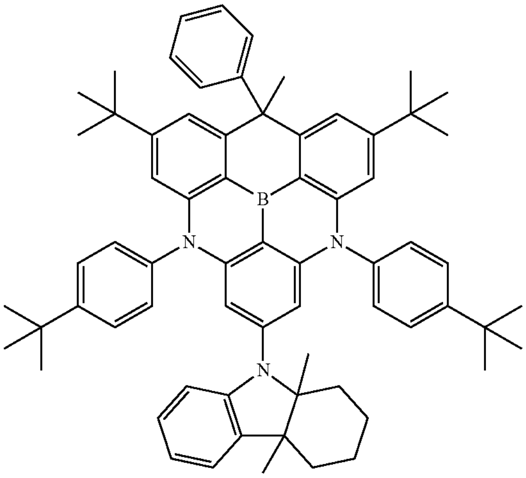
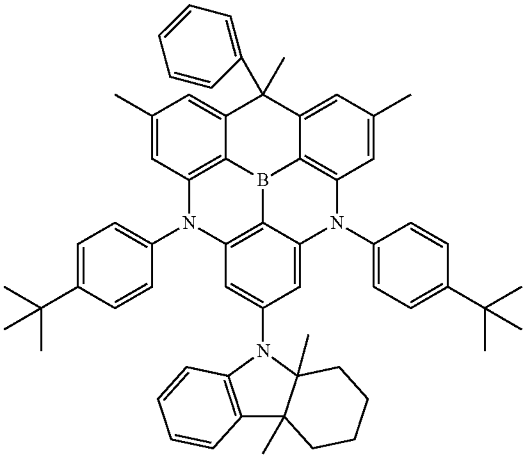

-continued
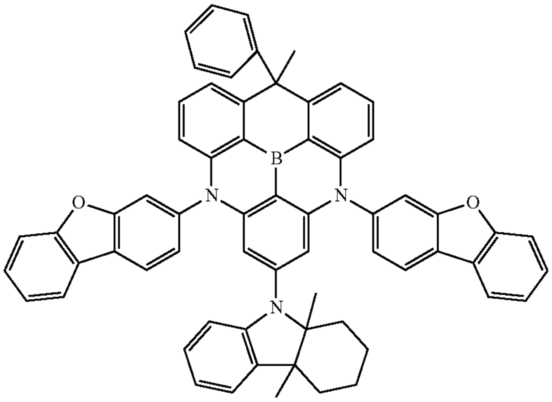
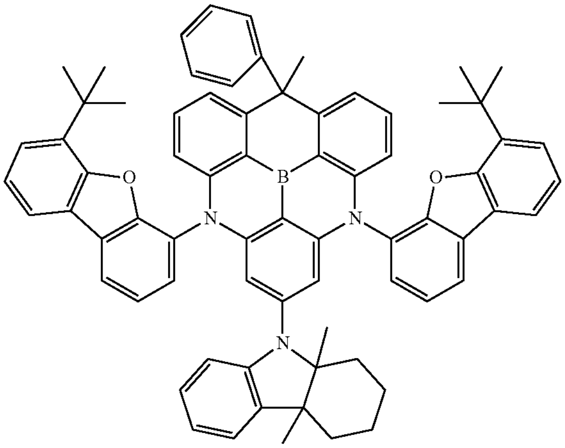
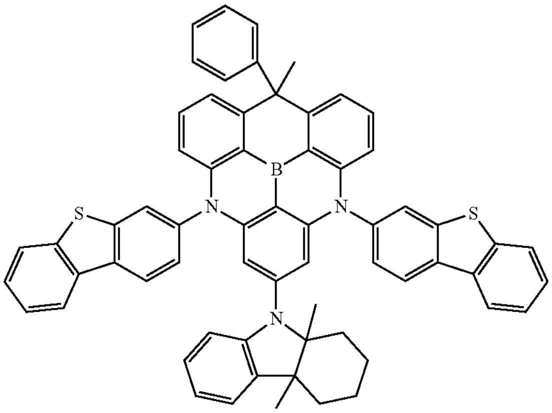
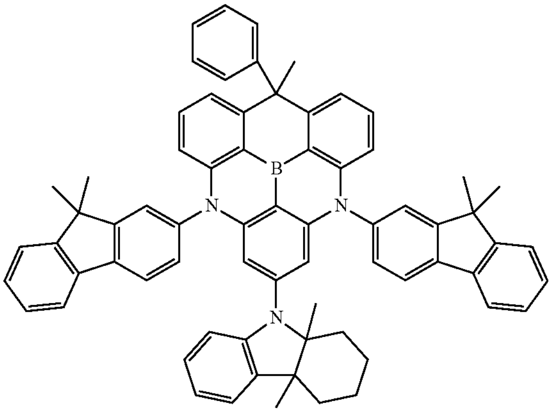
-continued
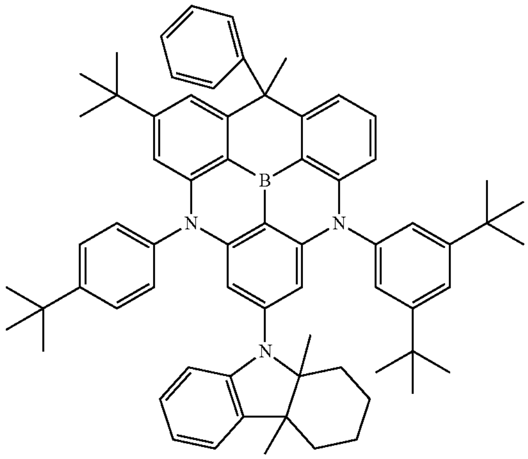
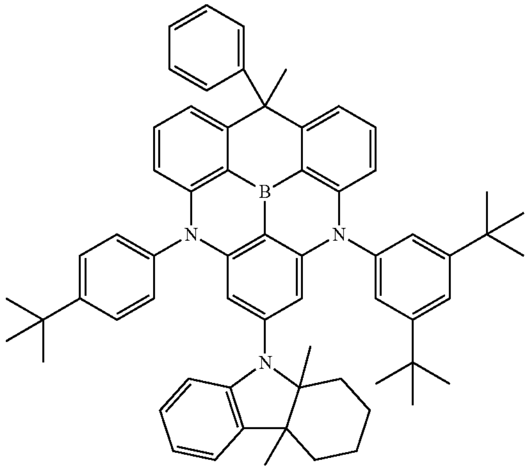
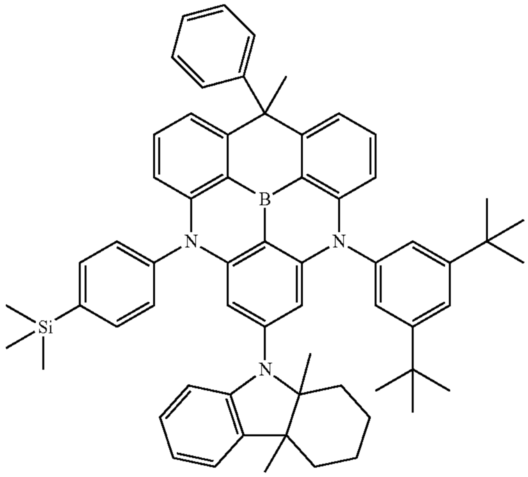

-continued
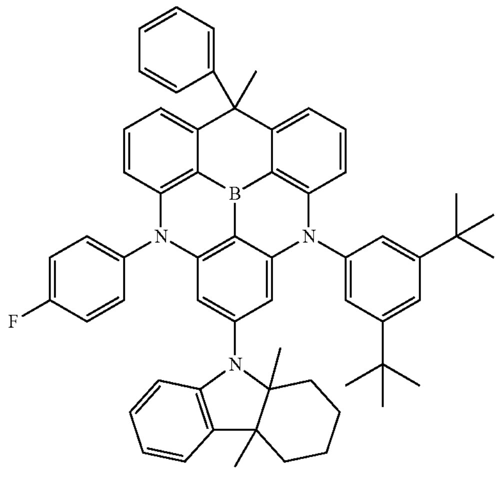
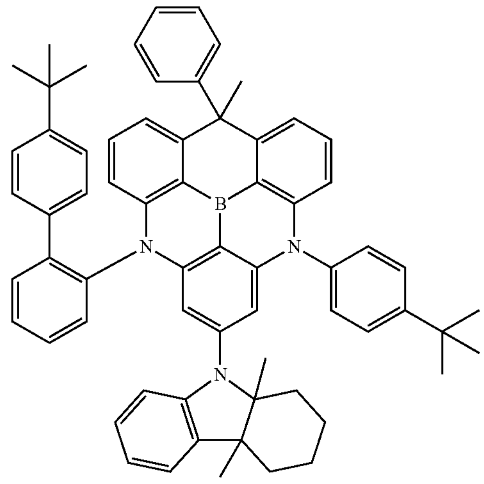
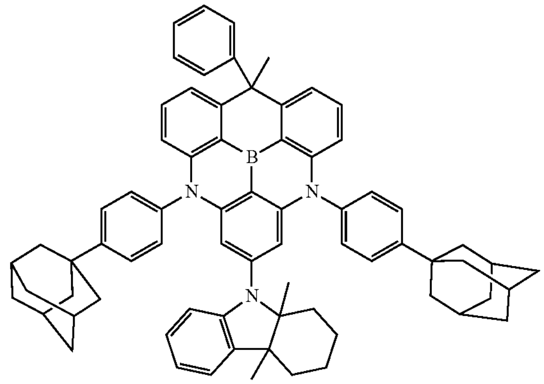
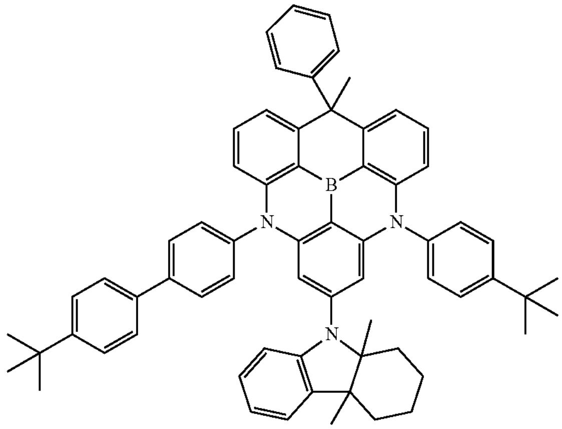
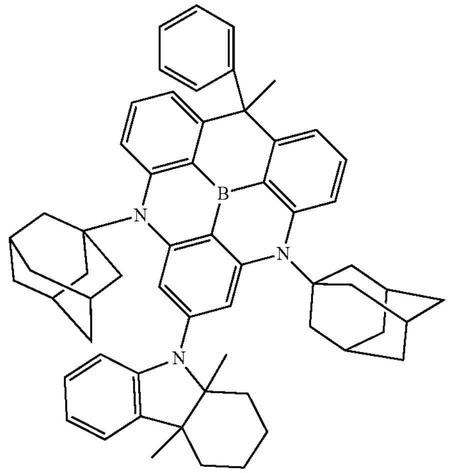
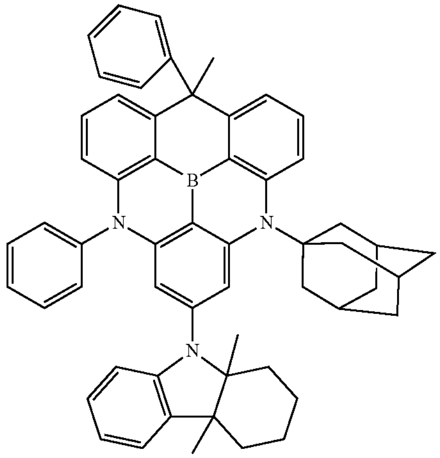

-continued
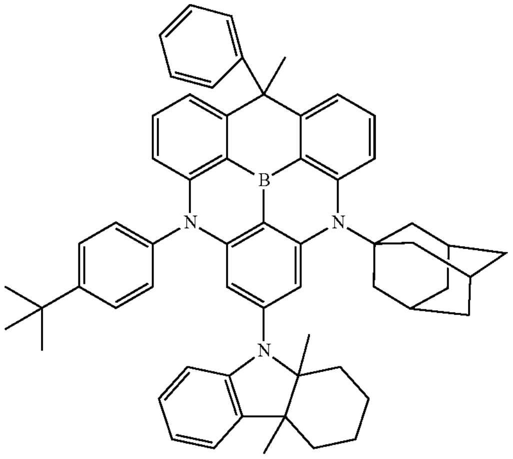
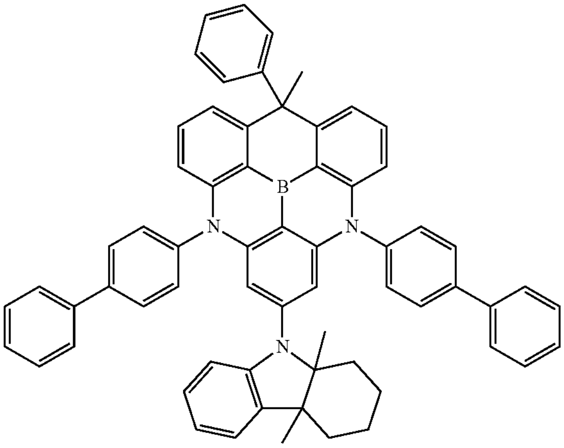
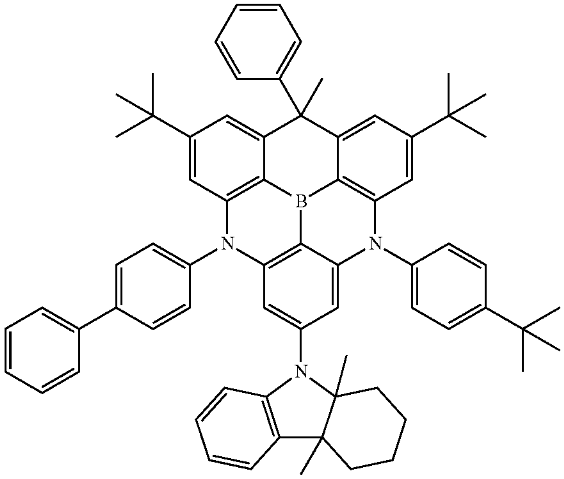
-continued
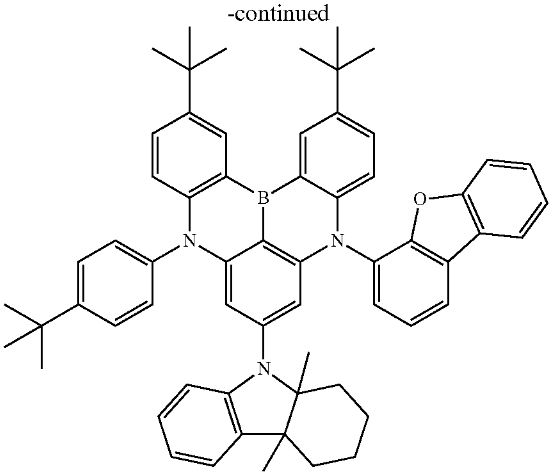
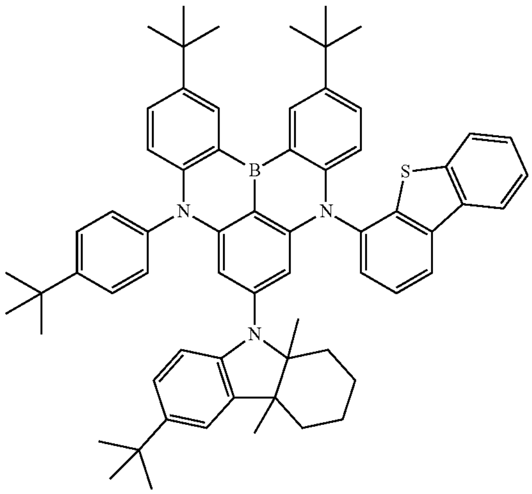
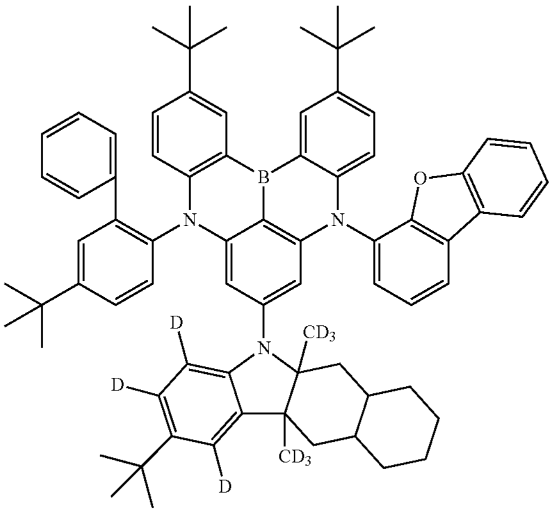

-continued
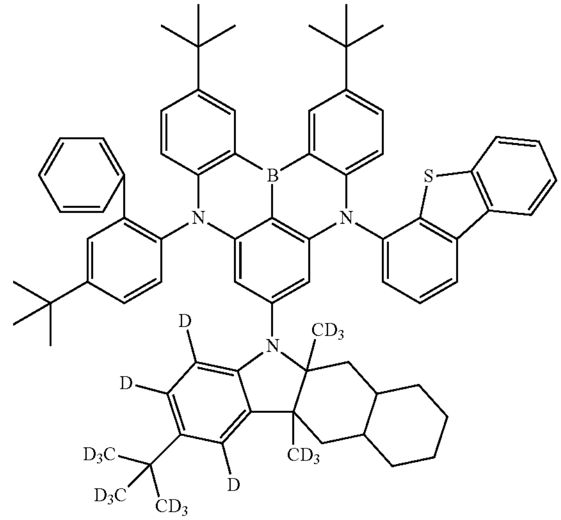
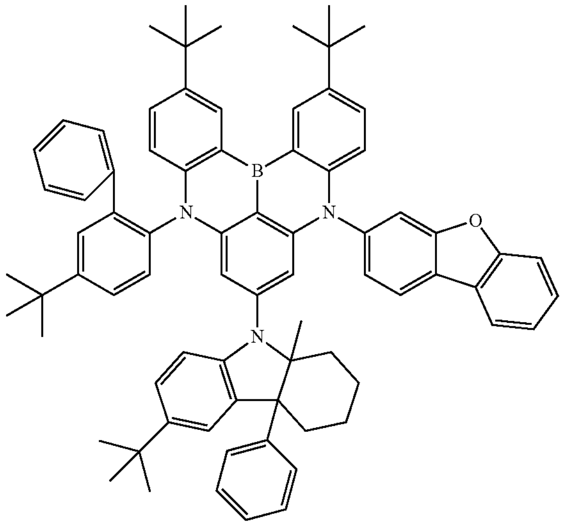
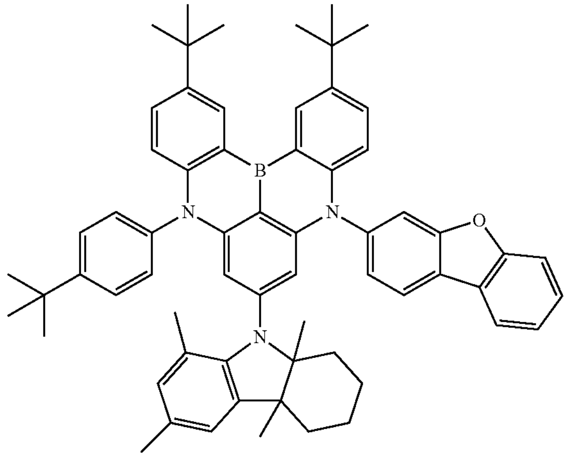
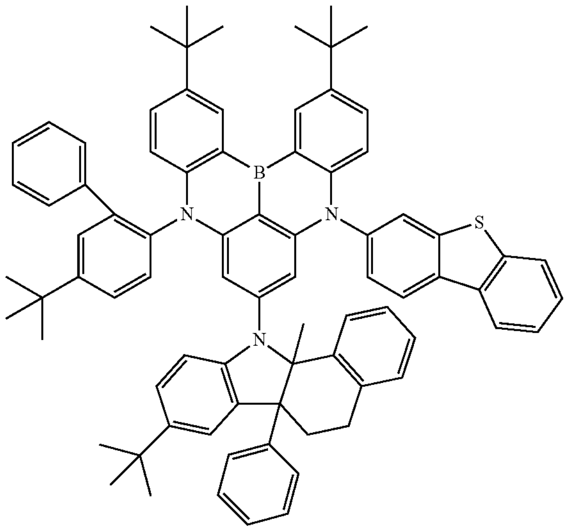
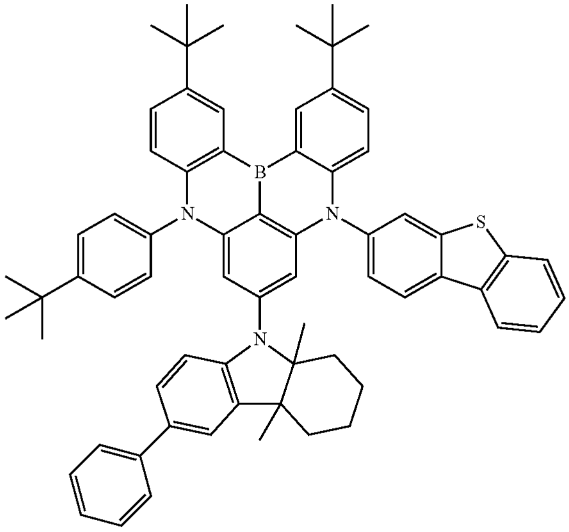
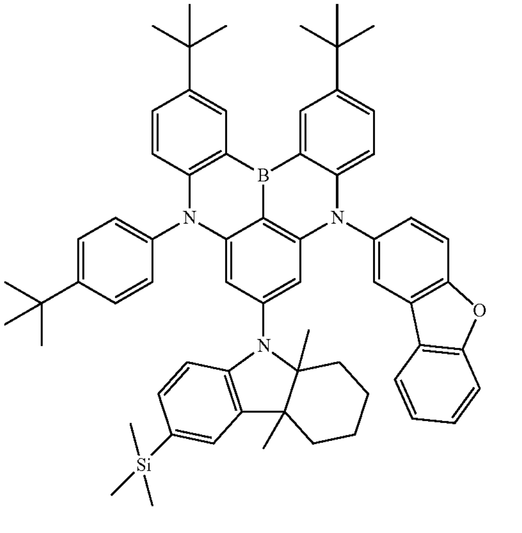
-continued -continued
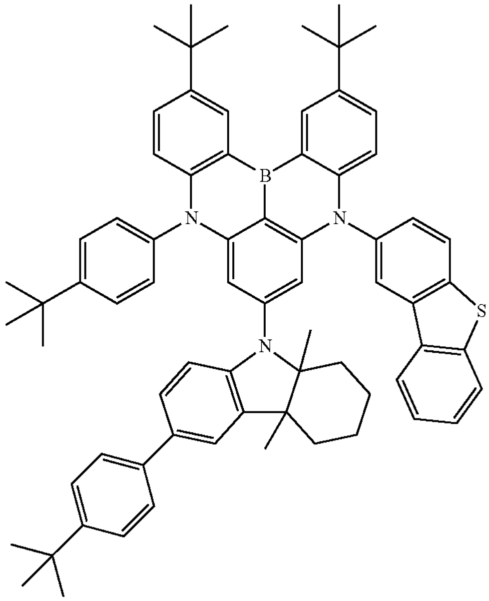
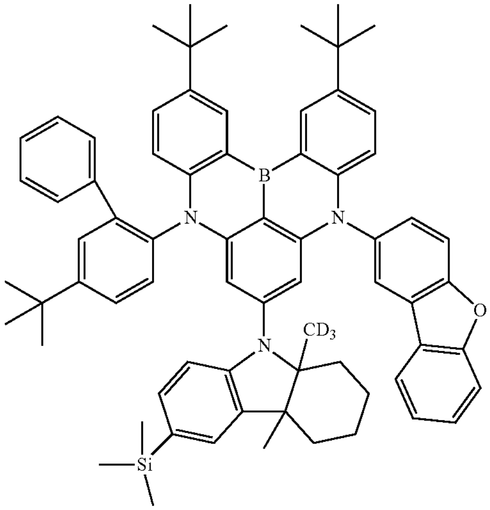
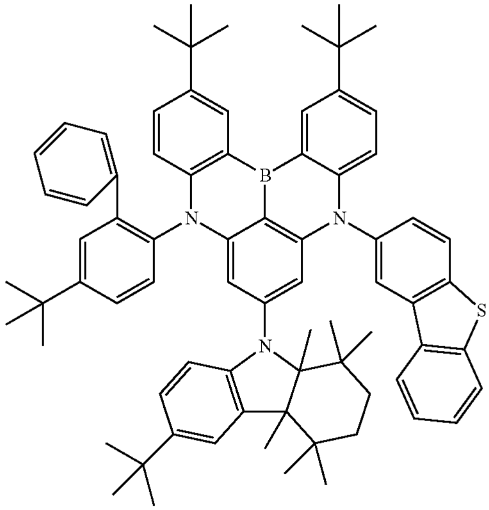
-continued
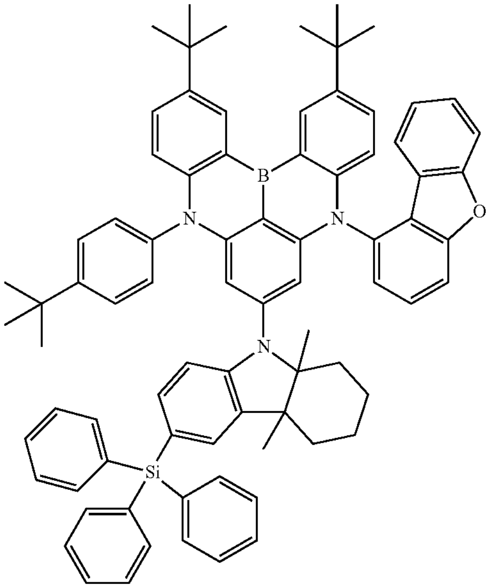
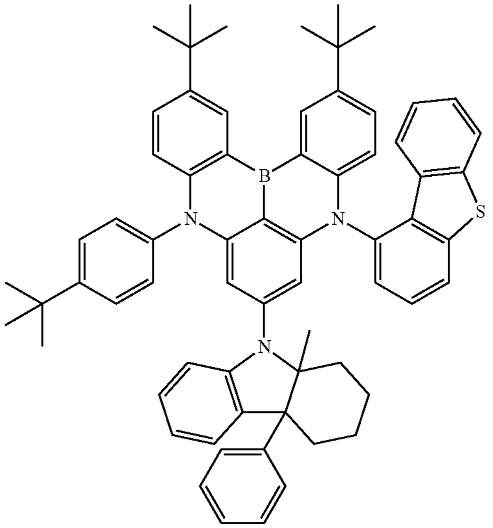
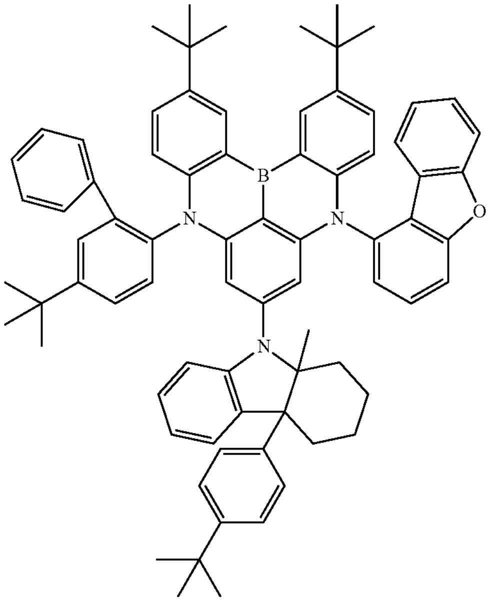

-continued
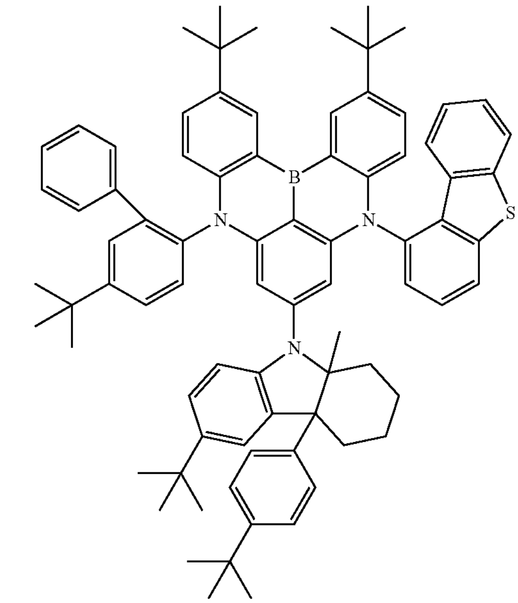
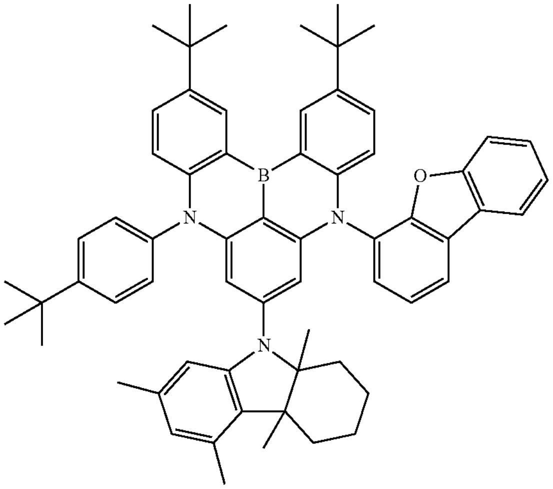
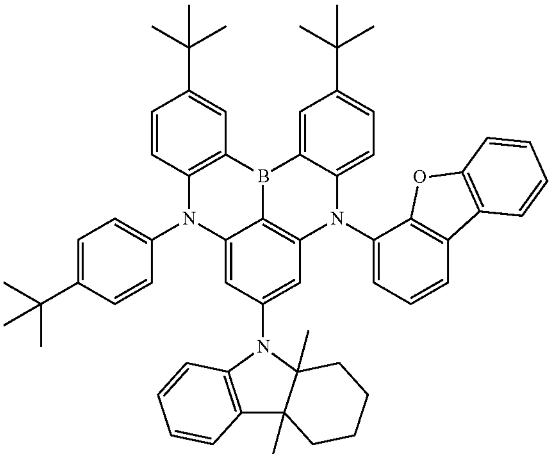
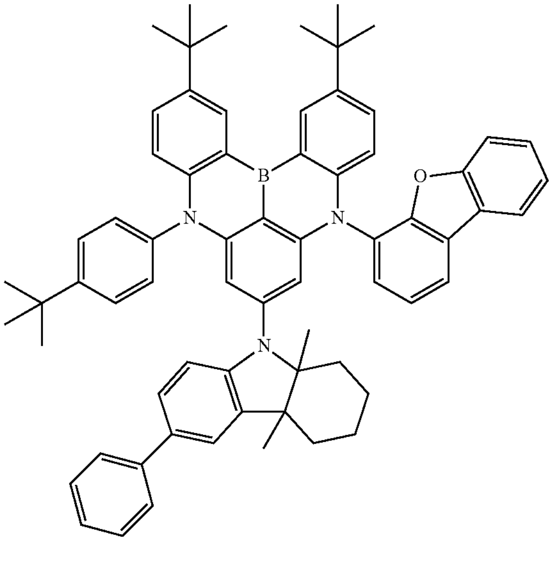
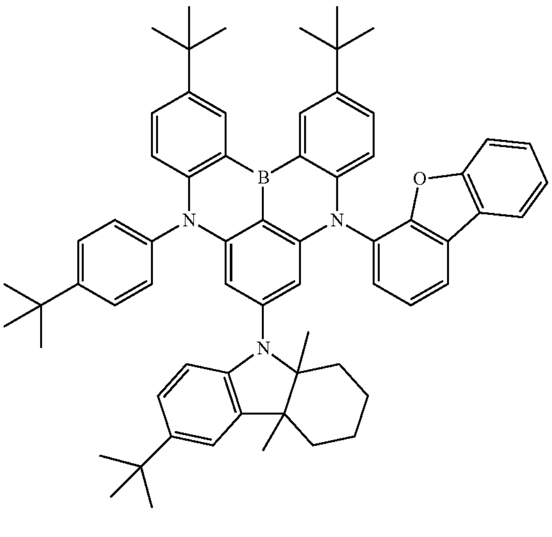
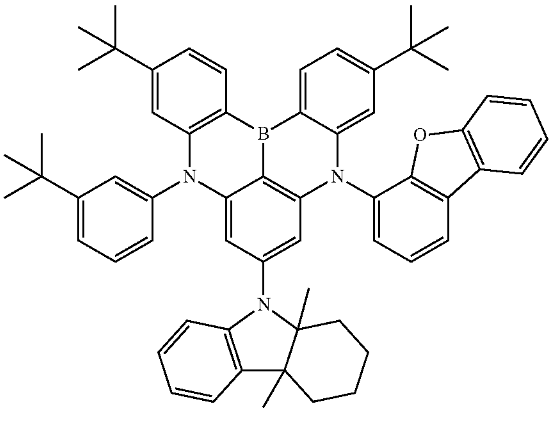

-continued
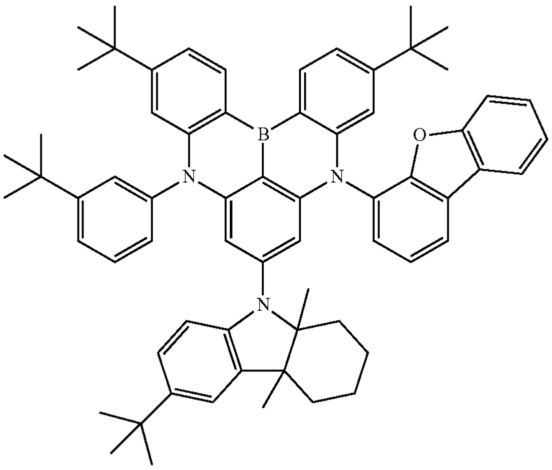
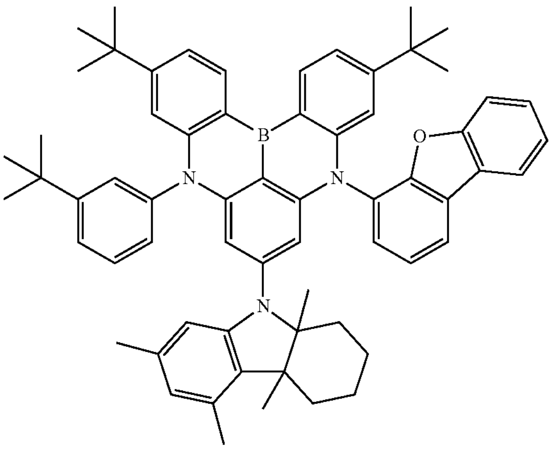
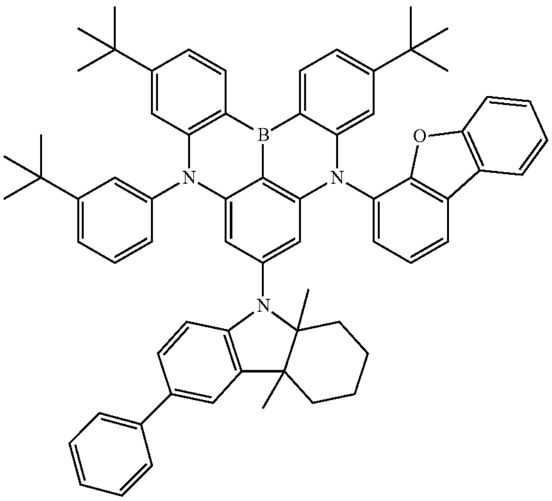
-continued
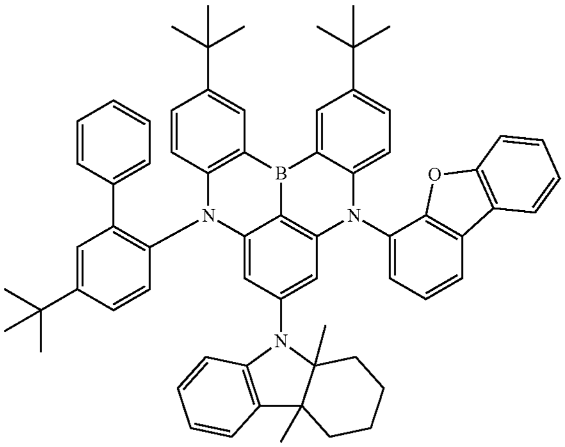
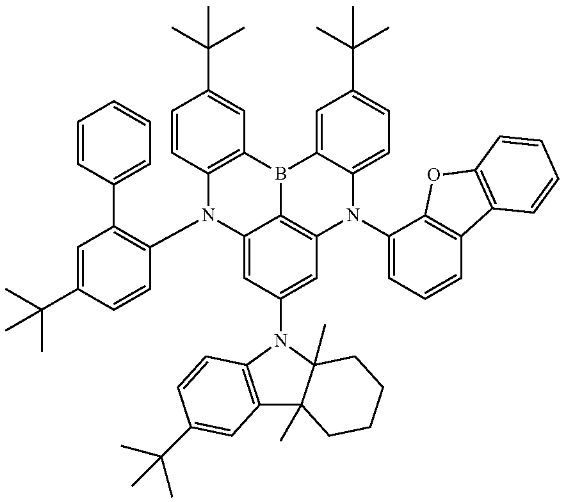
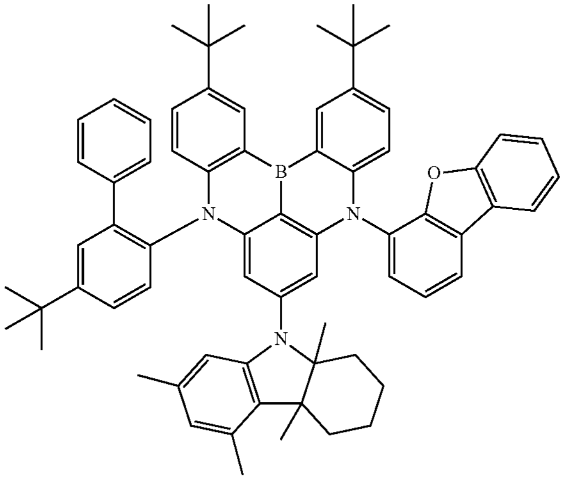

-continued
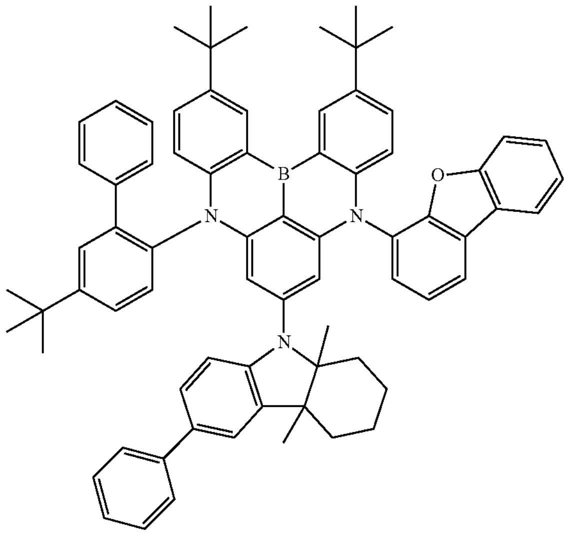
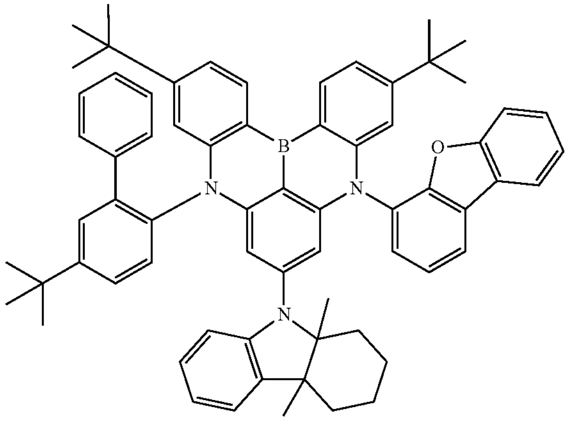
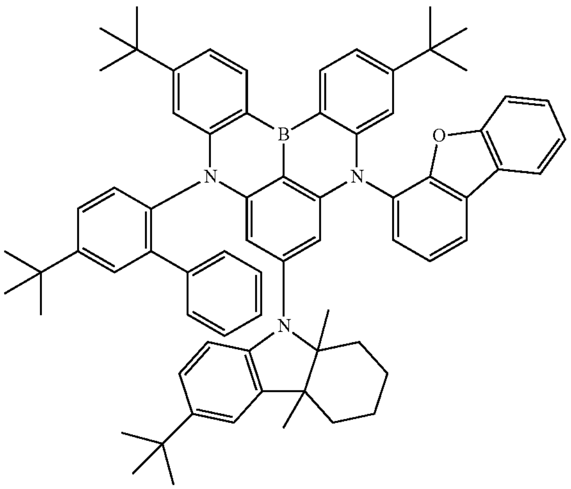
-continued
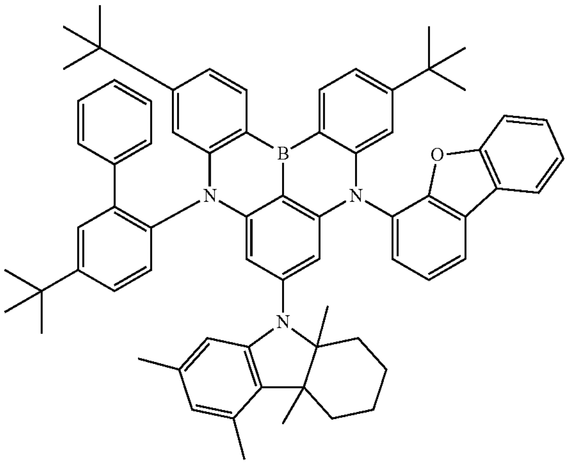
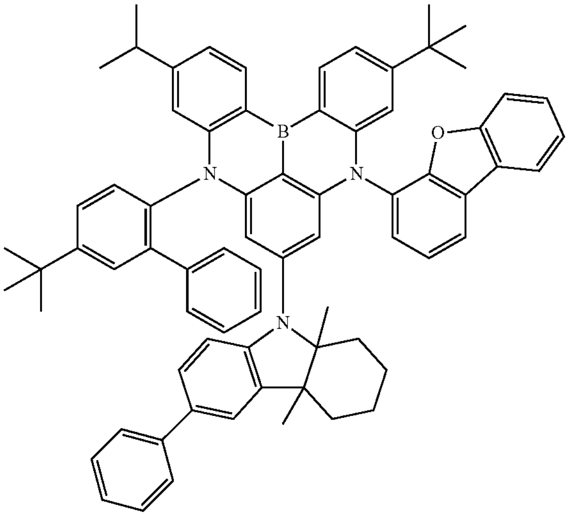
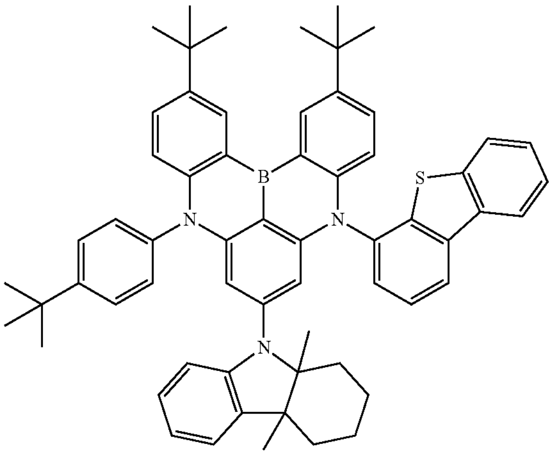

-continued
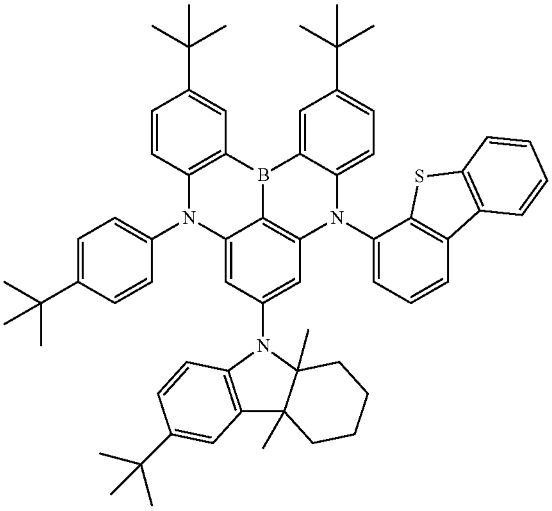
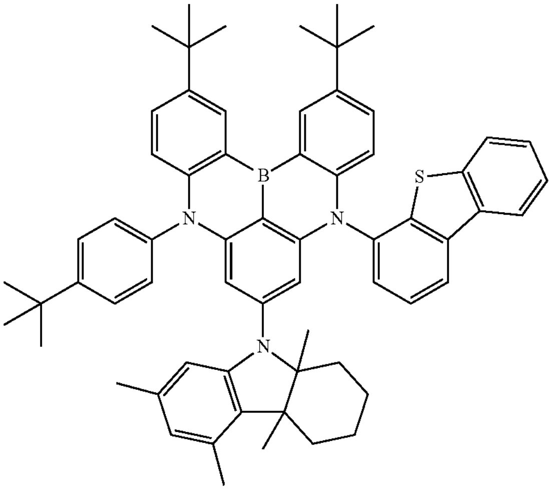
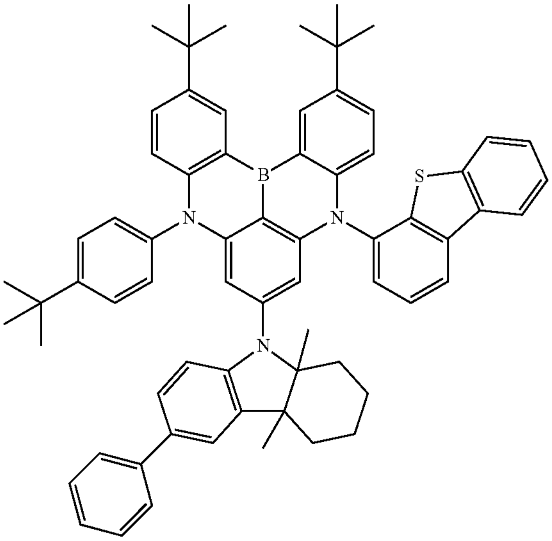
-continued
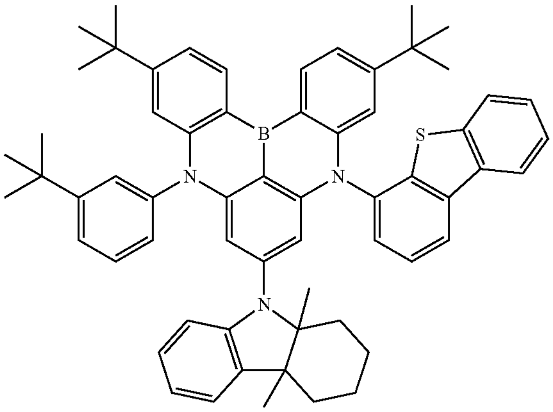
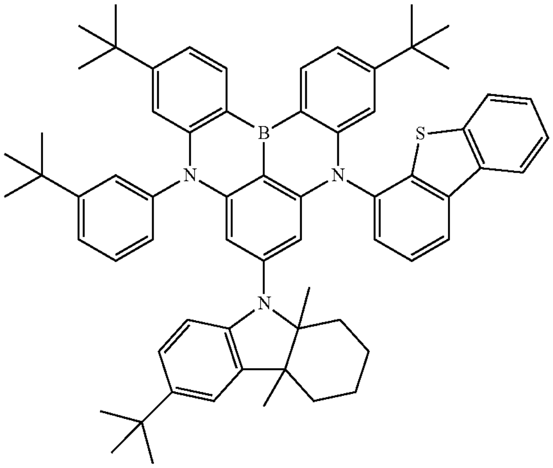
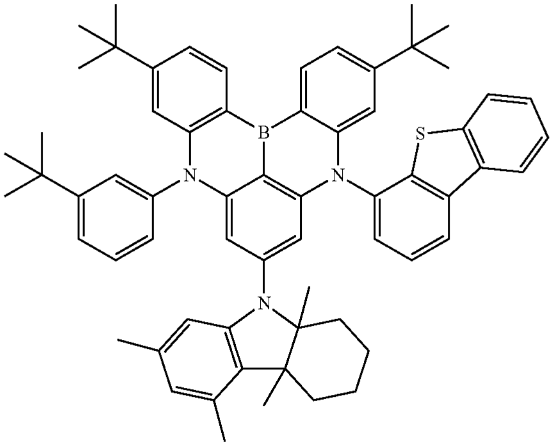

-continued
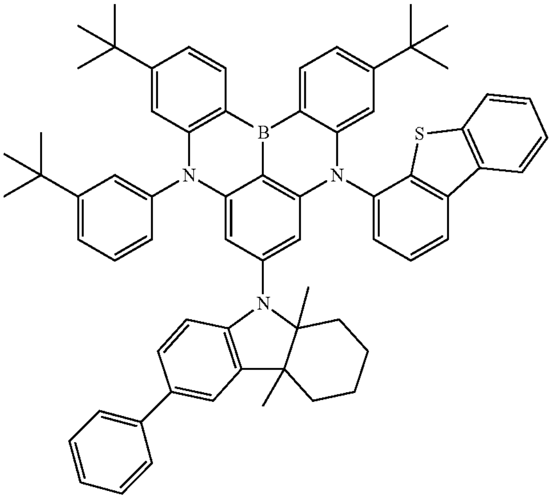
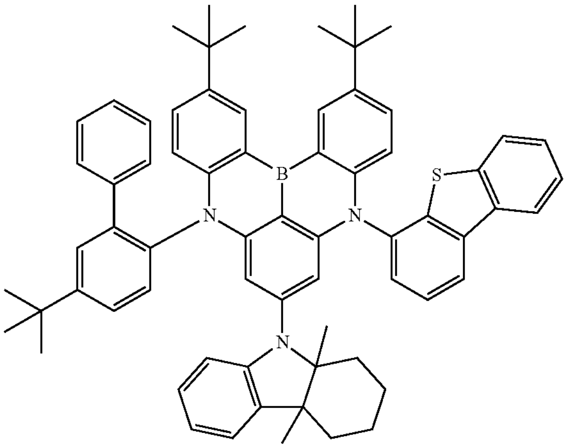
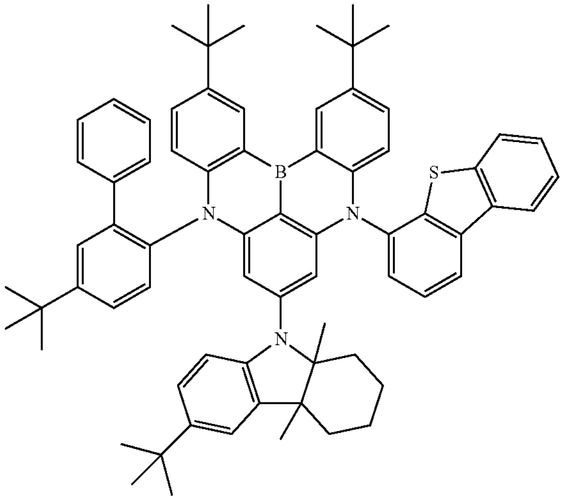
-continued
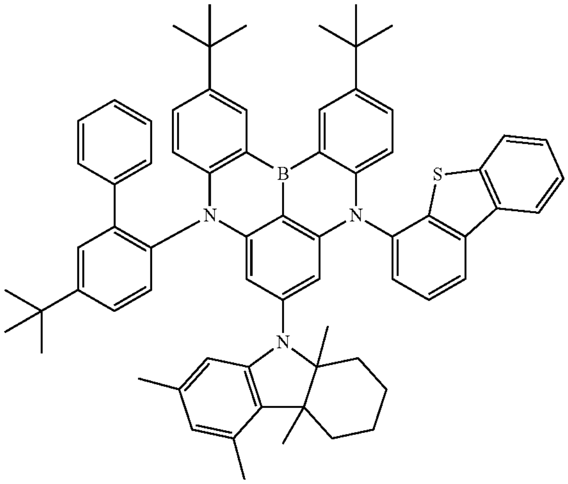
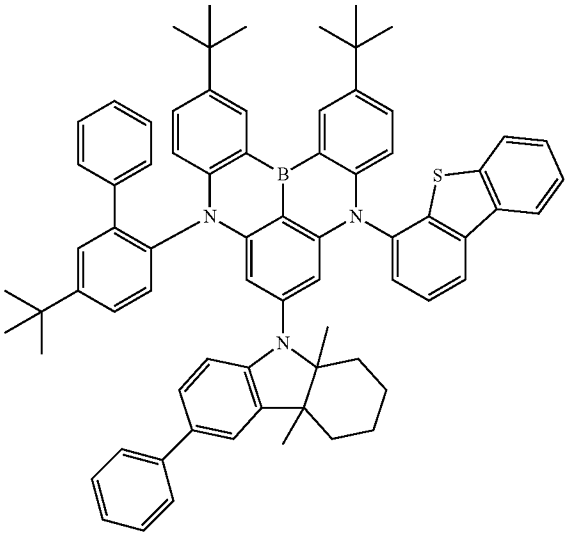
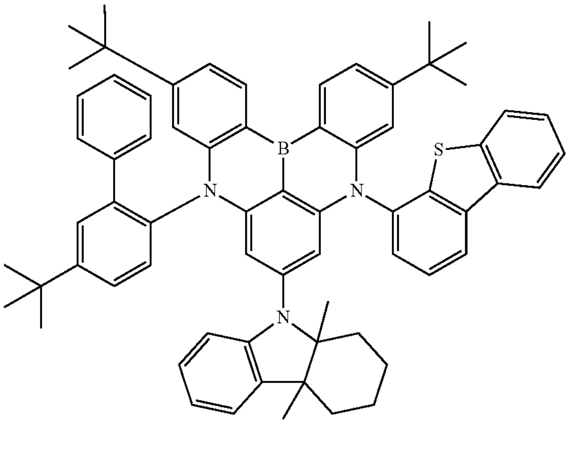

-continued
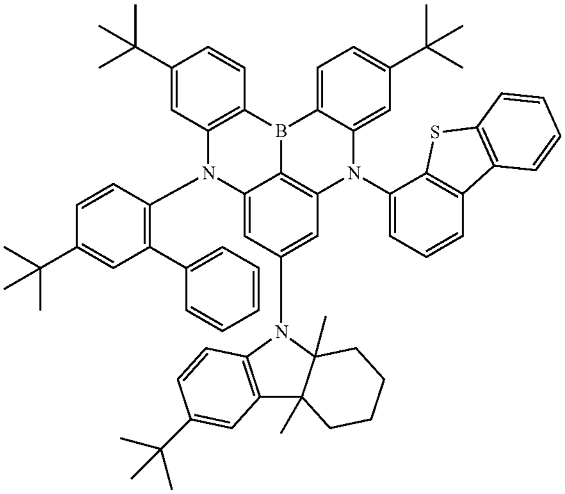
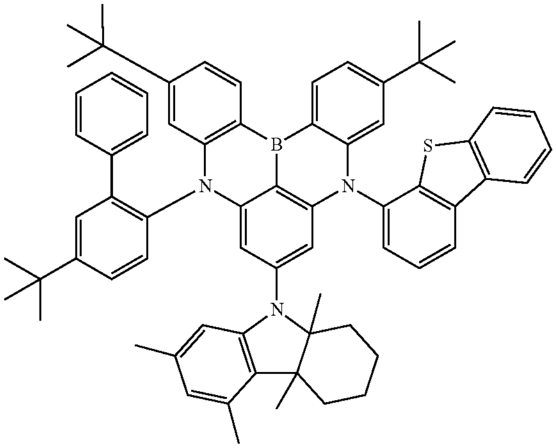
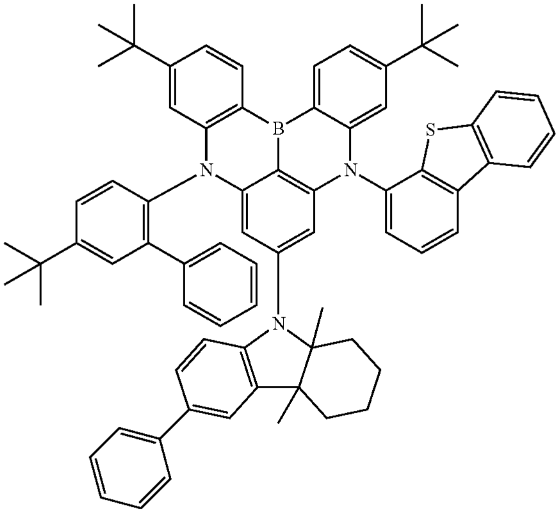 [SMILES: CC(C)(C)c1ccc(N2c3cc(C(C)(C)C)ccc3B3c4ccc(C(C)(C)C)cc4N(c4cccc5c4sc4ccccc45)c4cc(N5c6ccc(-c7ccccc7)cc6C6(C)CCCCC56C)cc2c43)c(-c2ccccc2)c1]
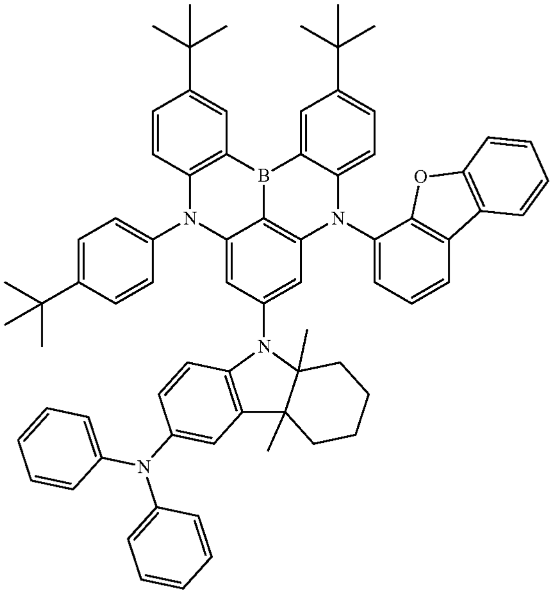
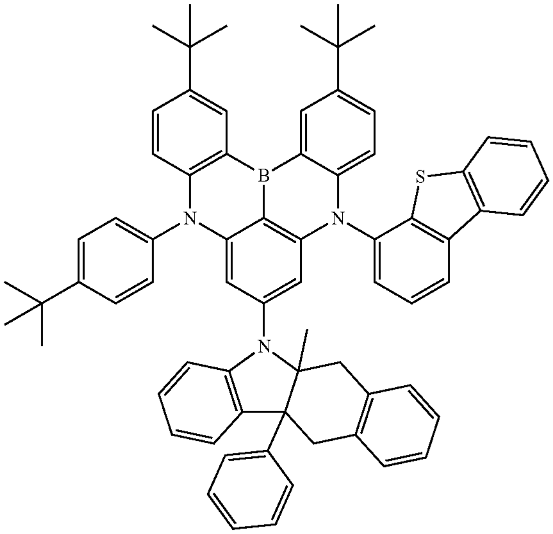
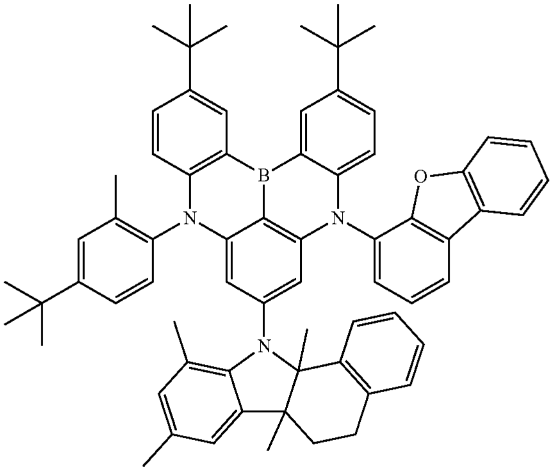

-continued
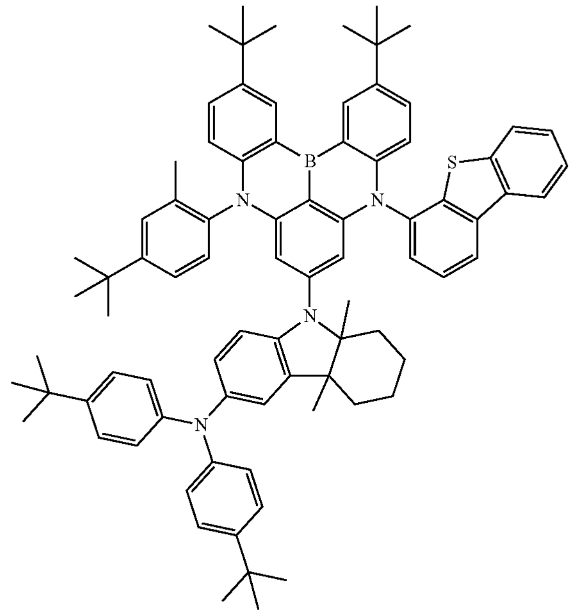
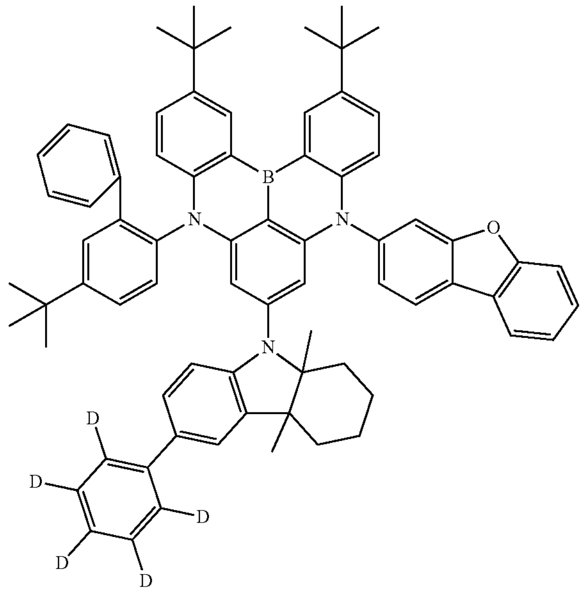
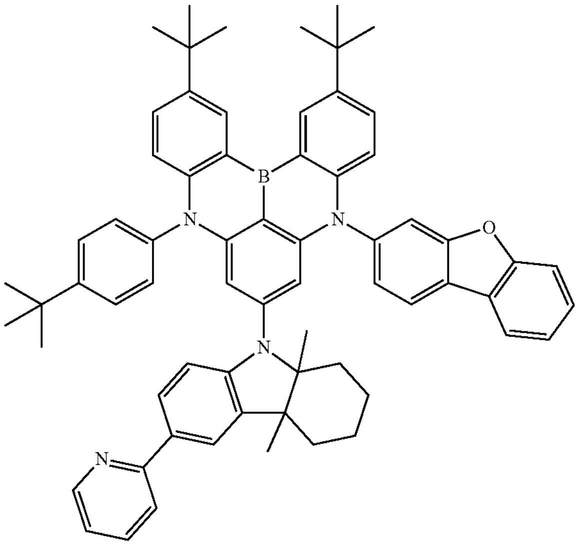
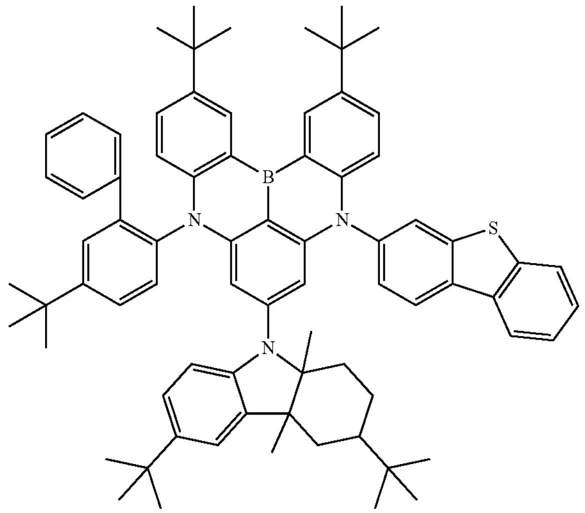
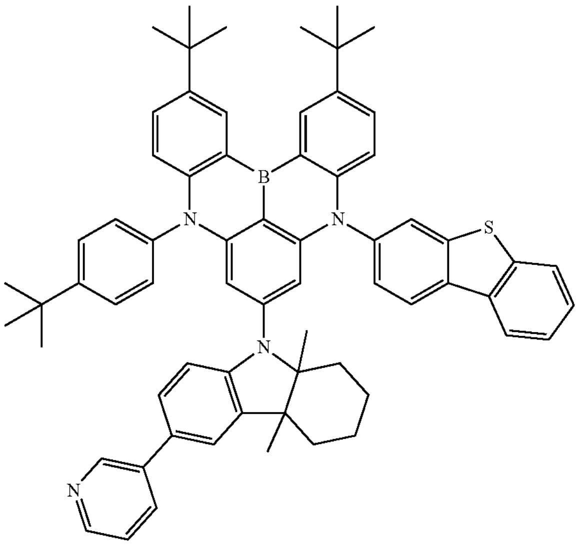
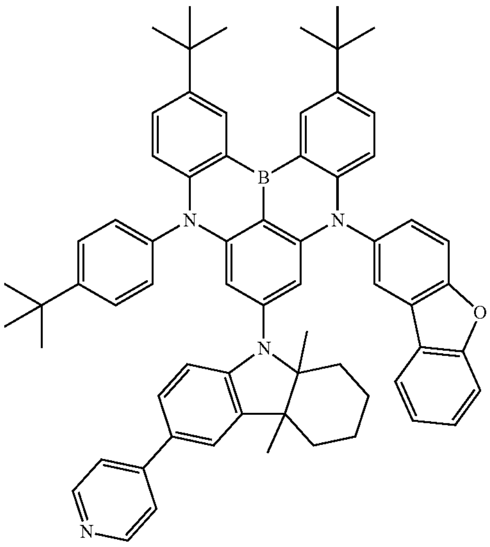
-continued -continued
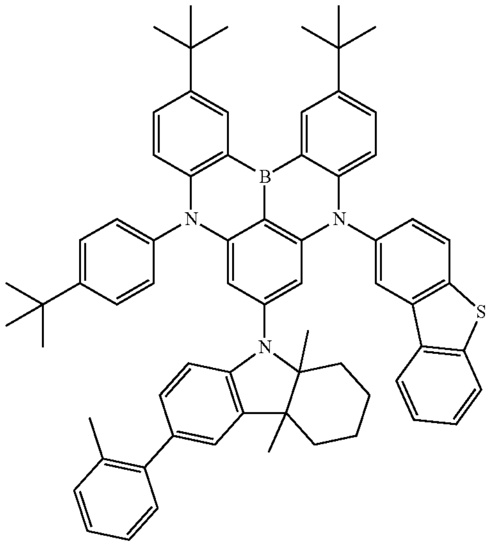
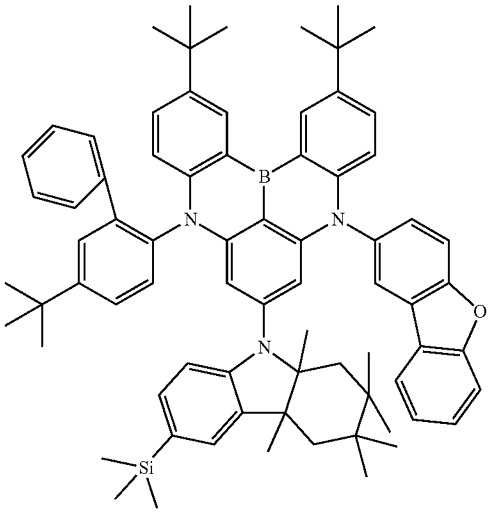
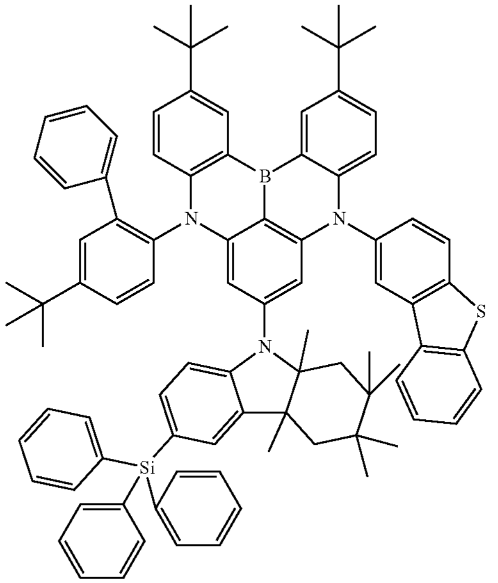
-continued
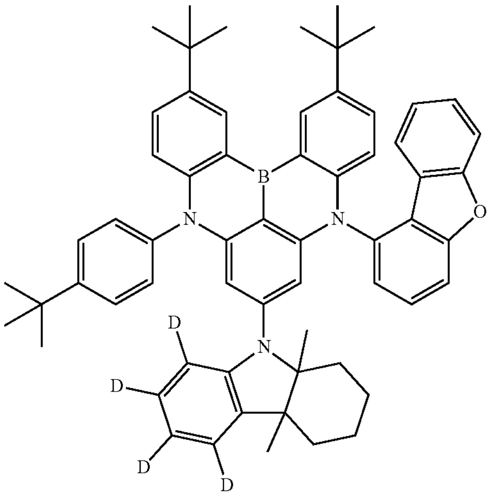
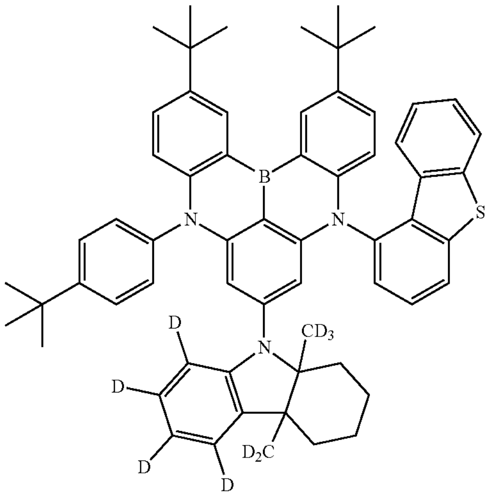
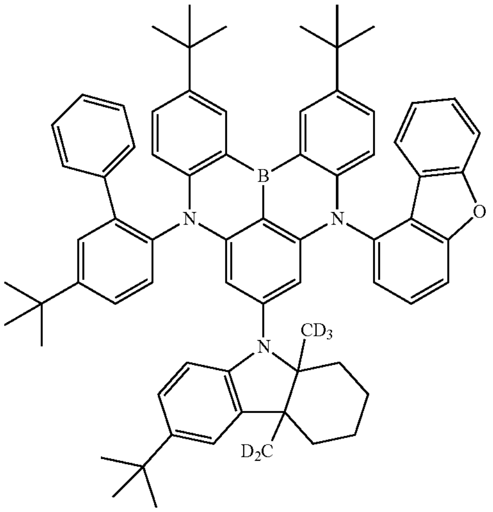

-continued
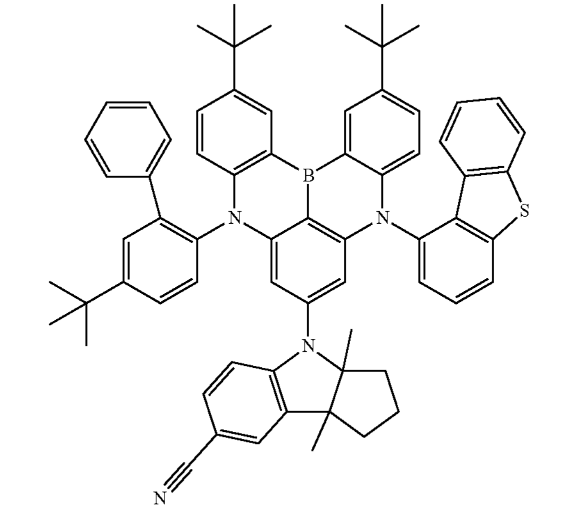
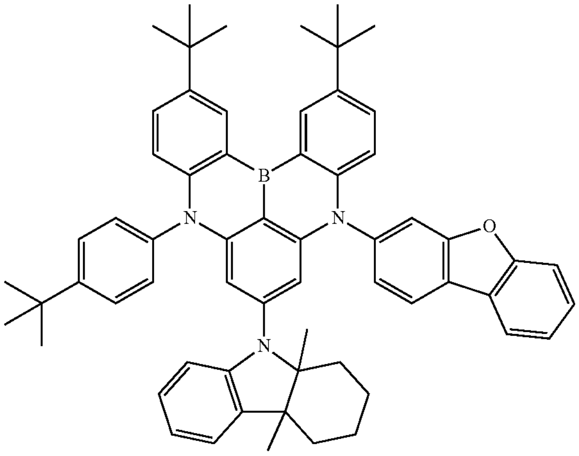
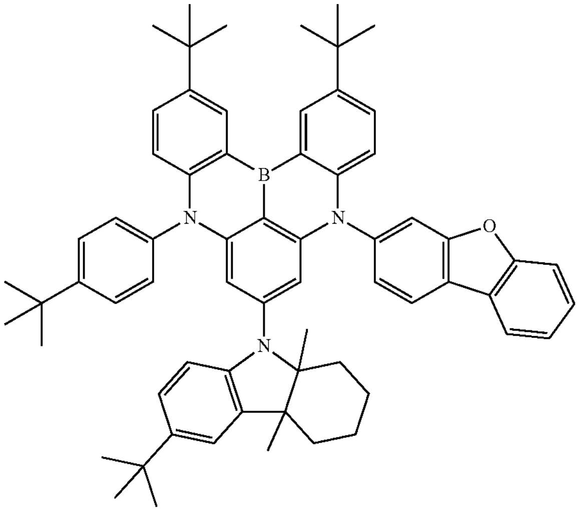
-continued
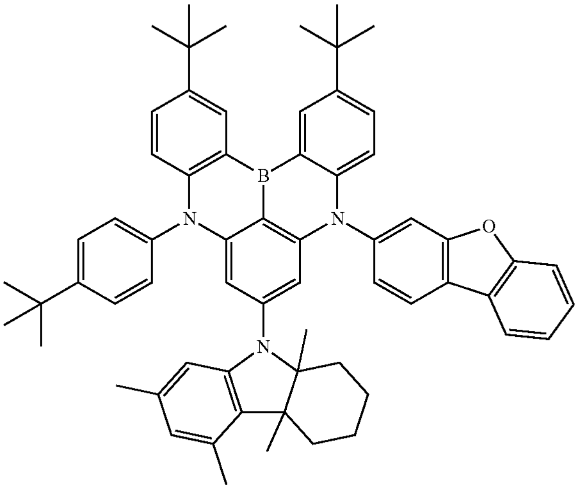
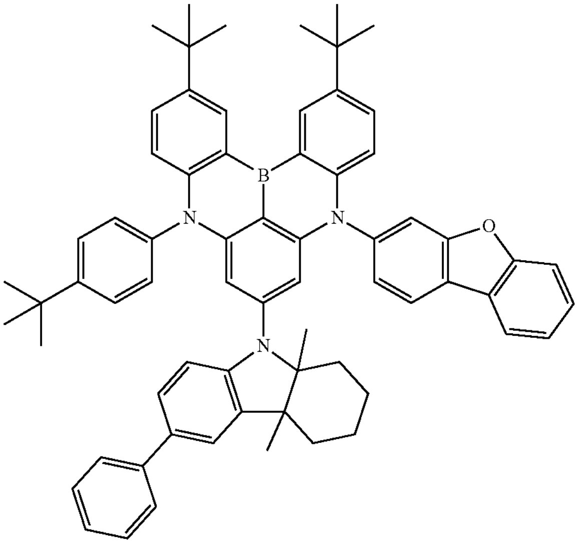
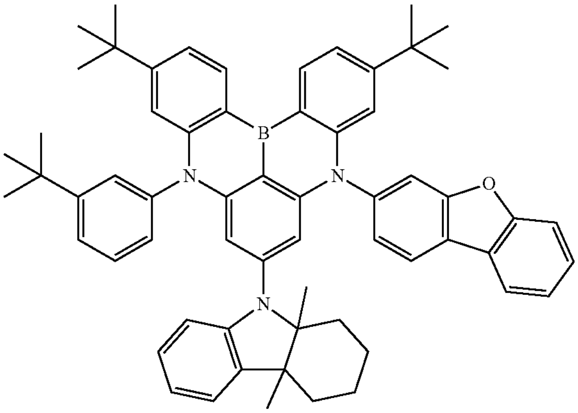

-continued
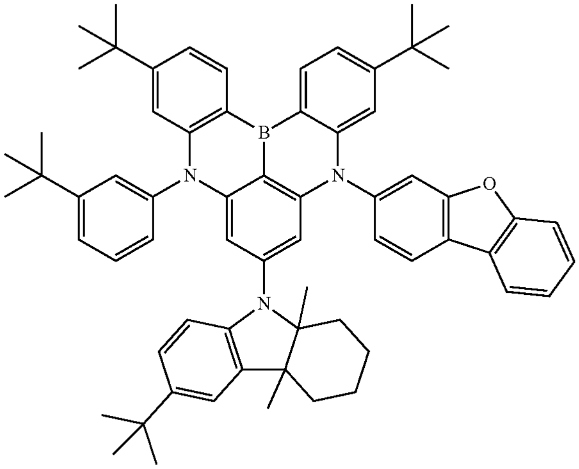
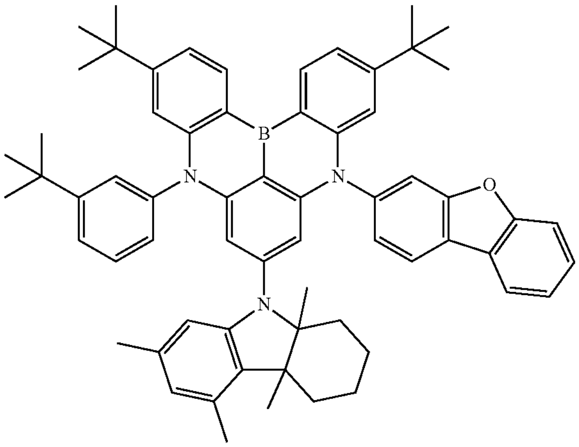
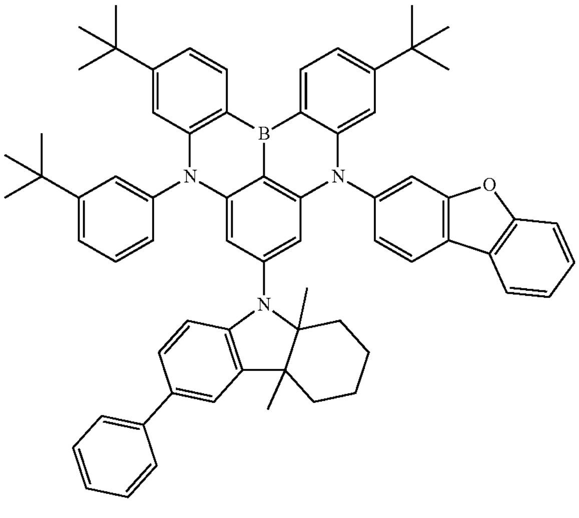
-continued
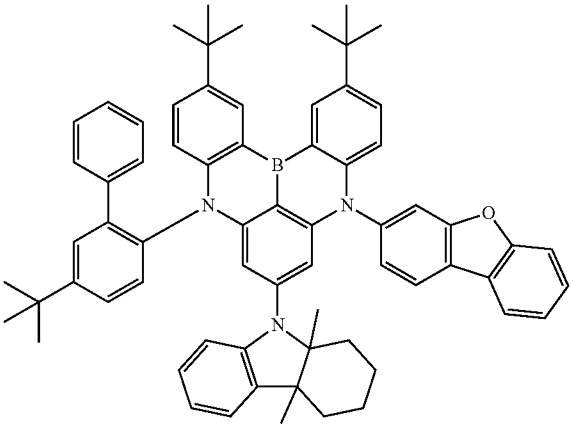
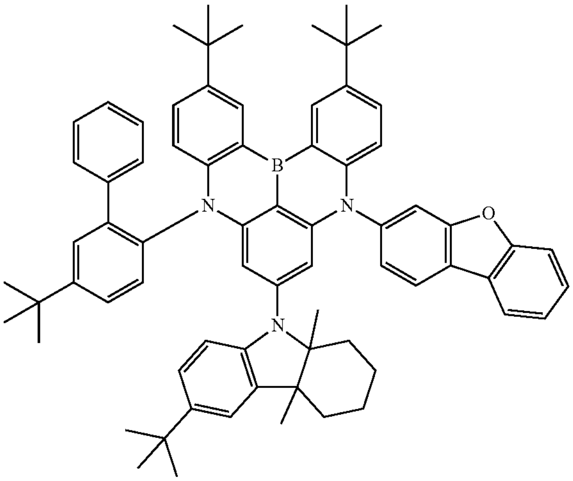
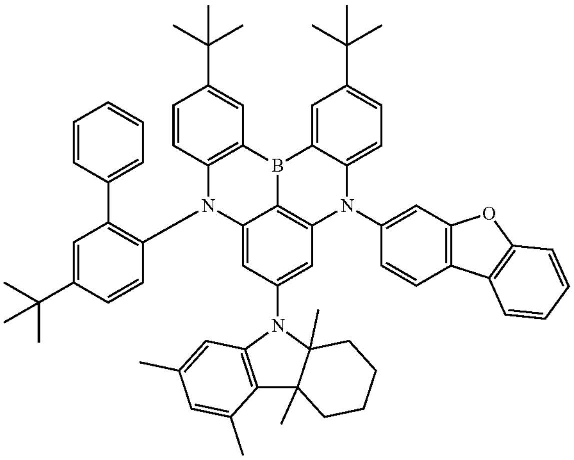

-continued
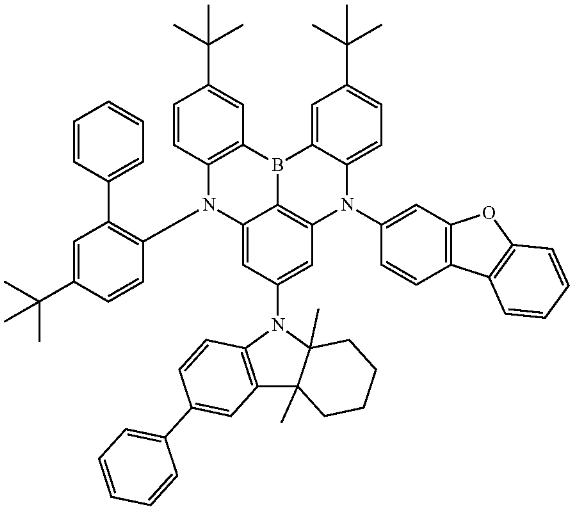
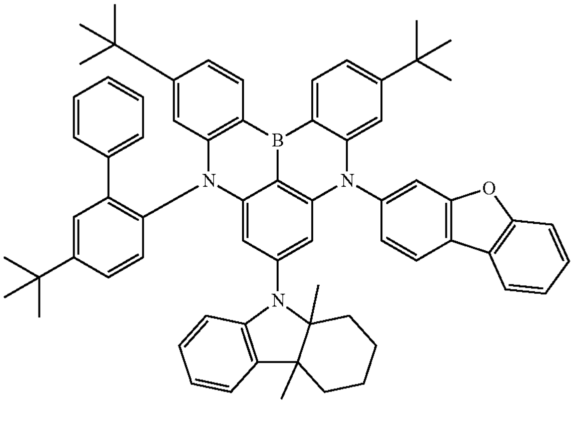
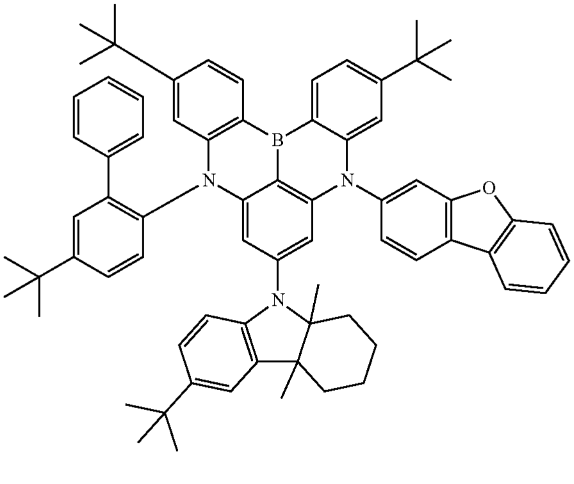
-continued
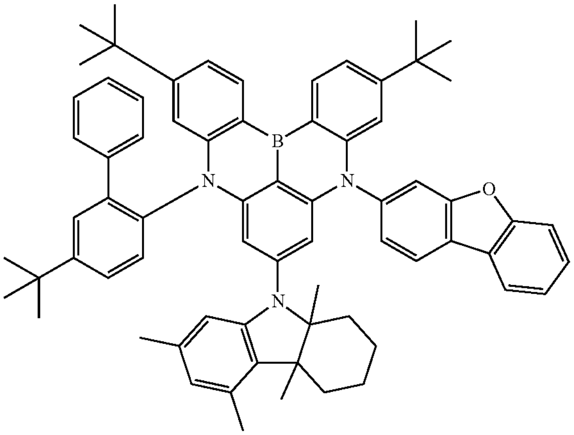
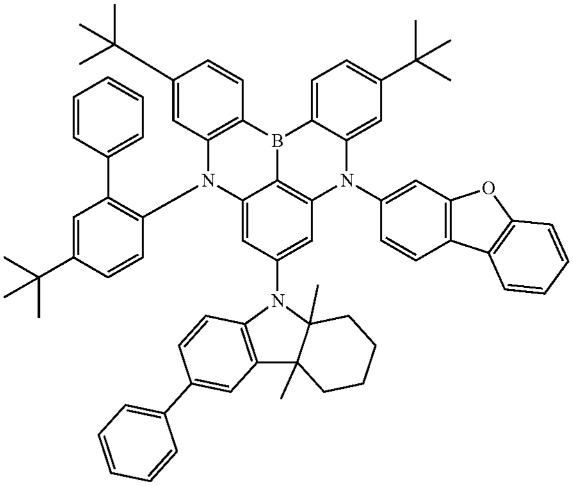
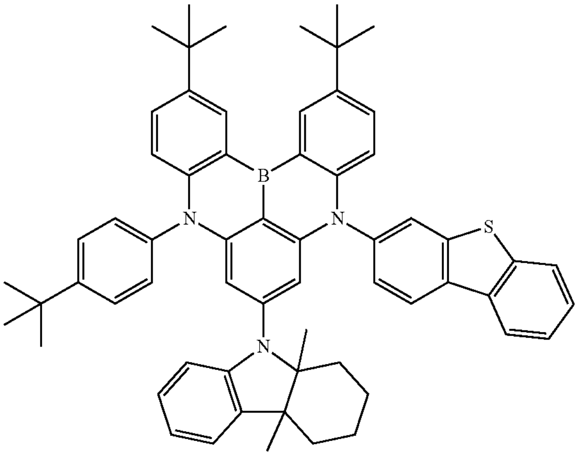

-continued
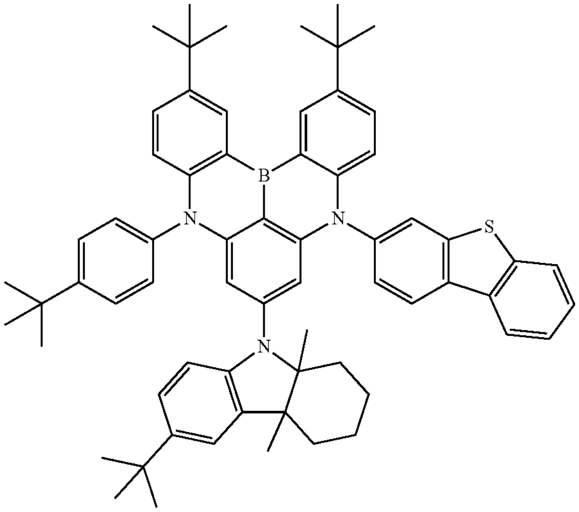
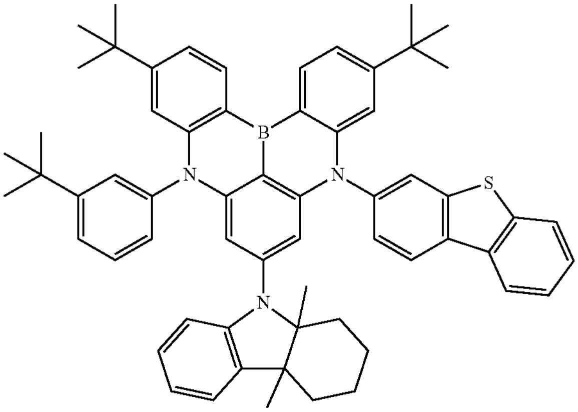
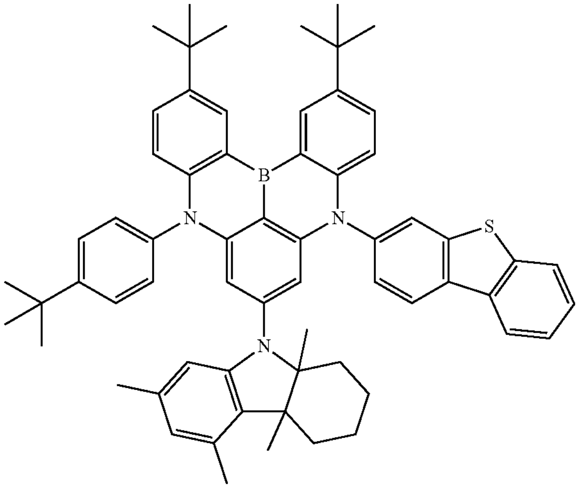
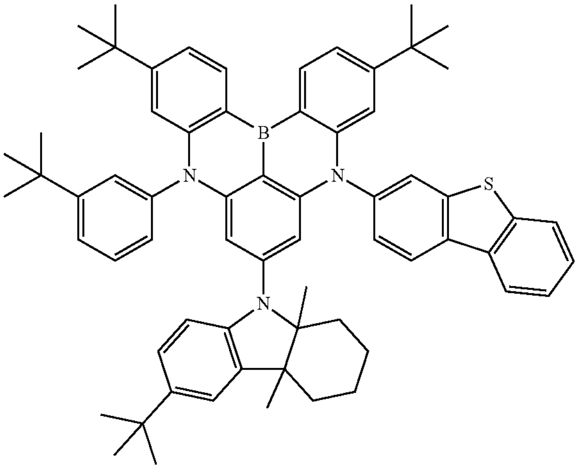
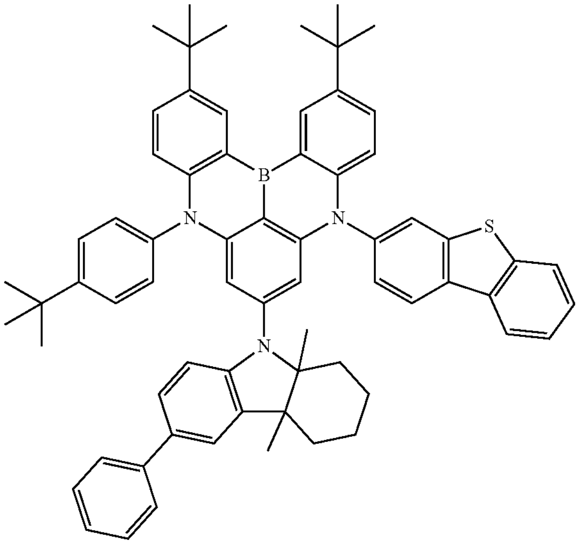
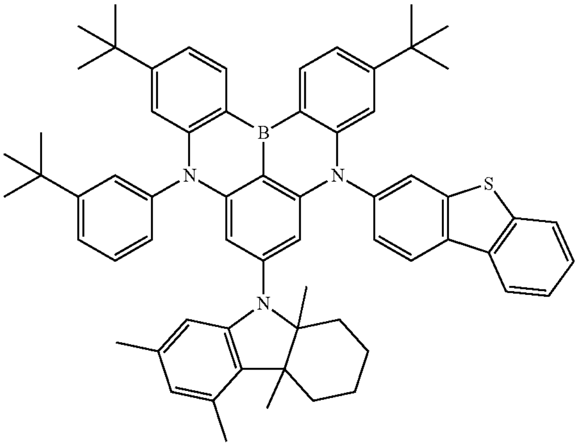
-continued -continued
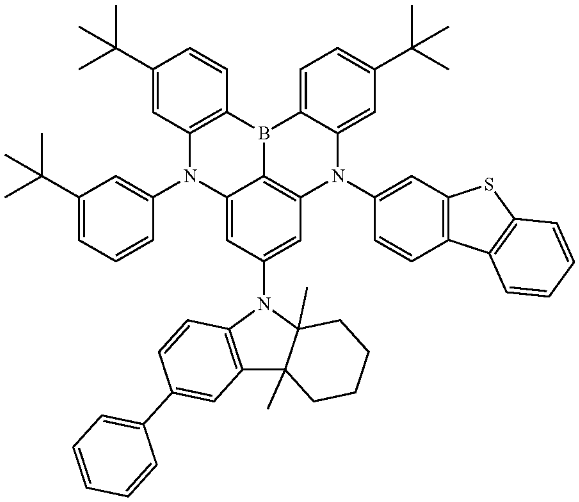
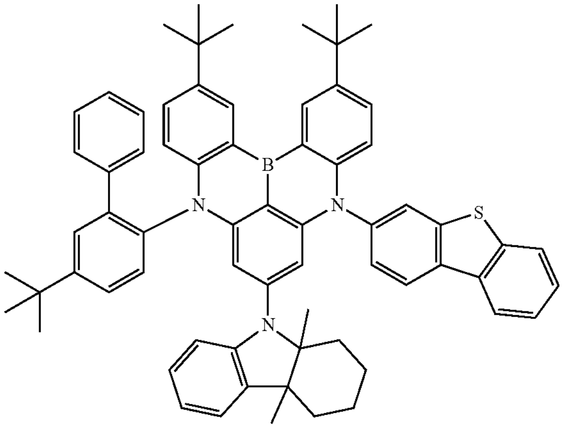
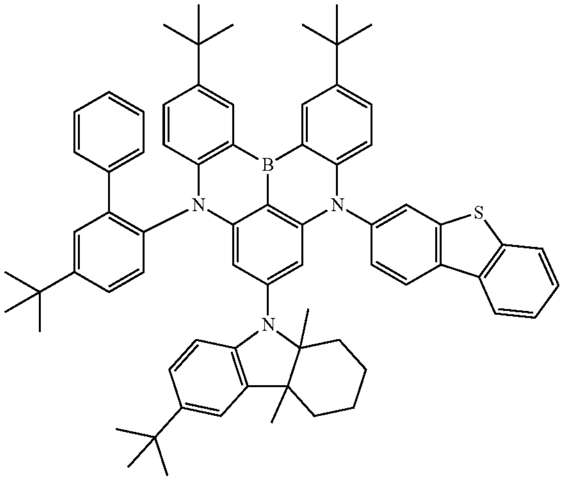
-continued
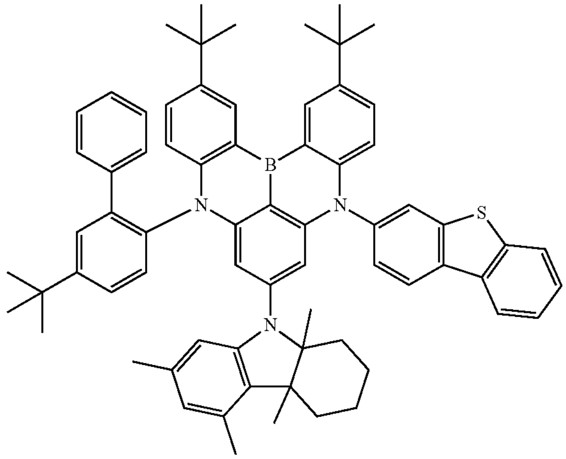
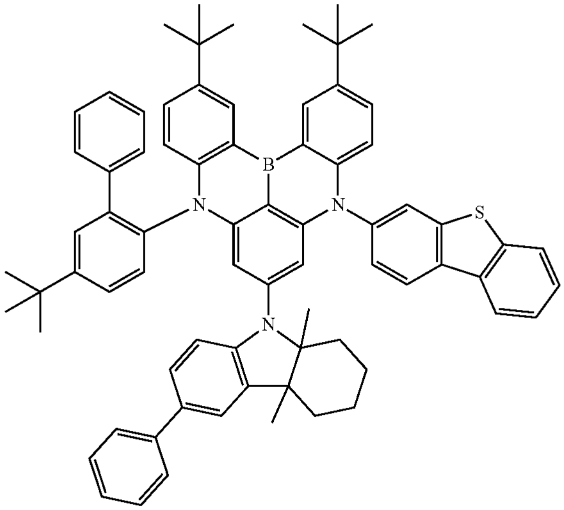
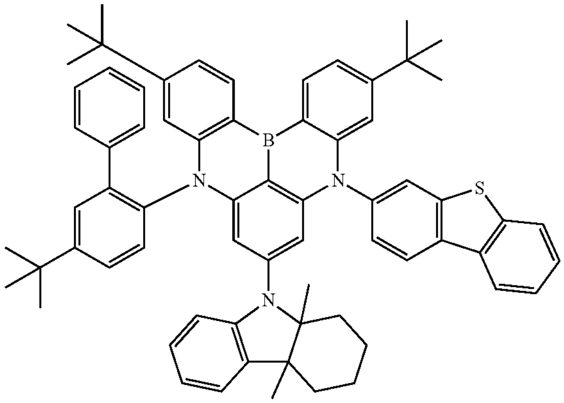

-continued
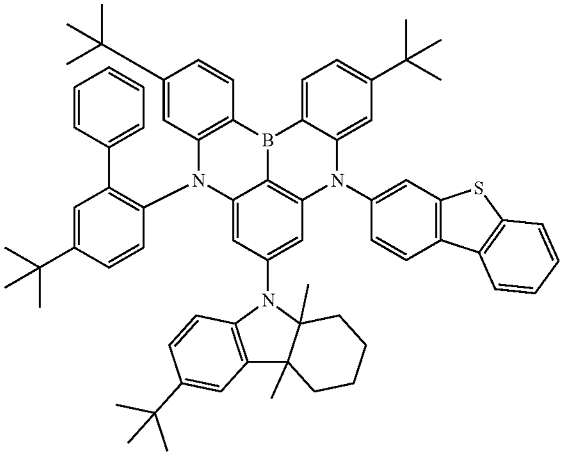
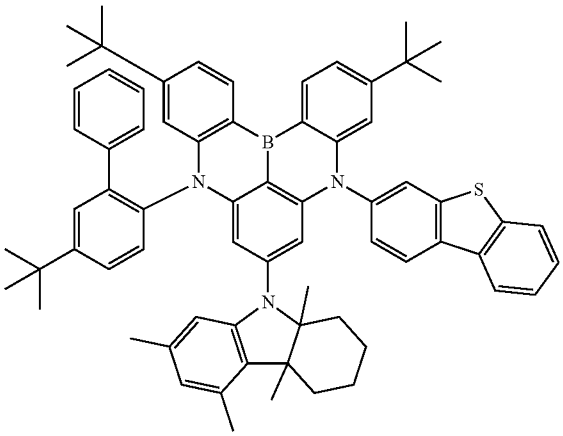
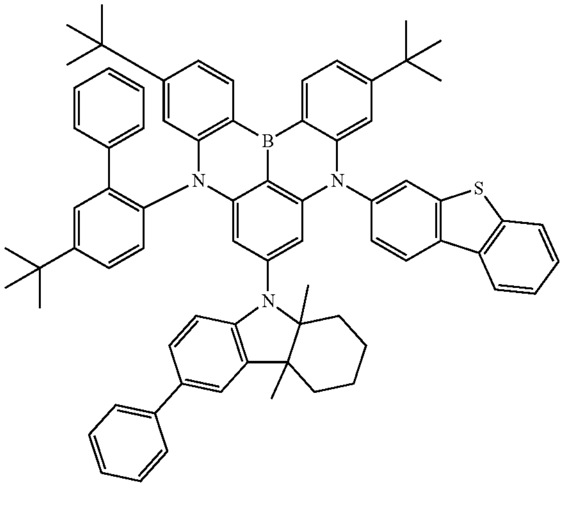
-continued
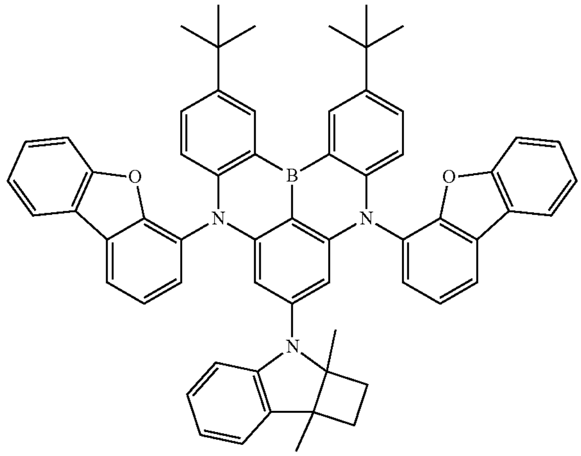
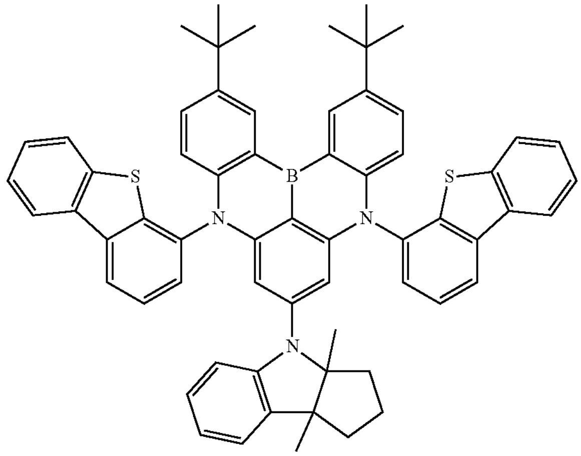
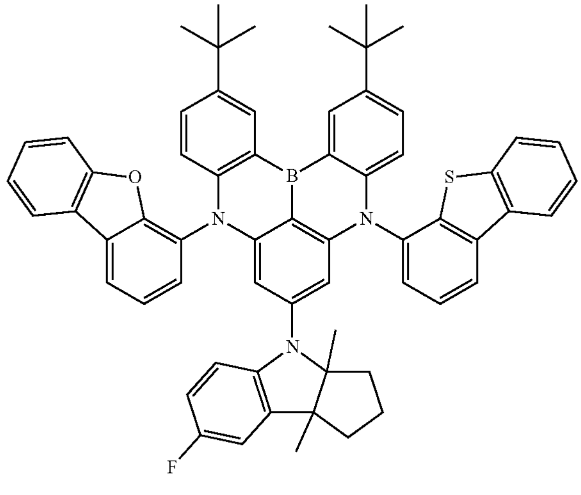

-continued
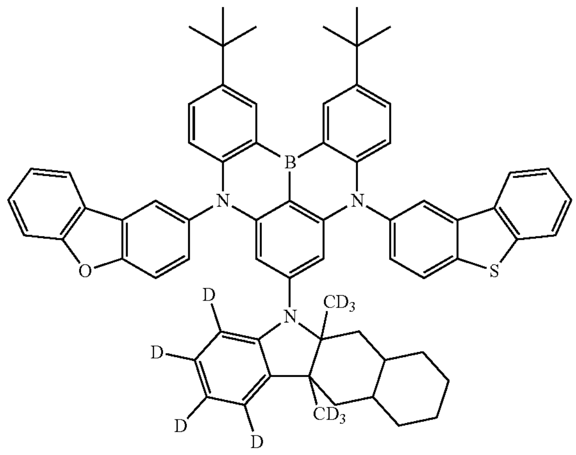
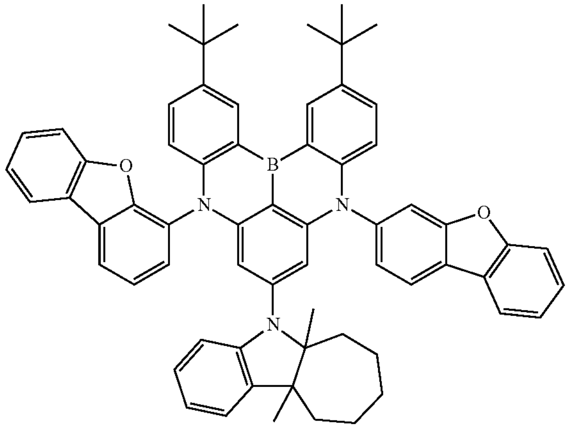
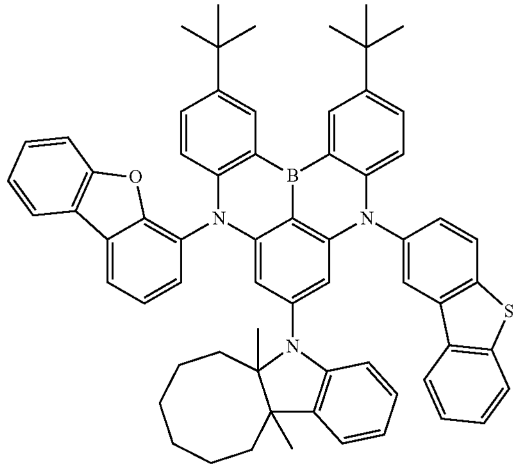
-continued
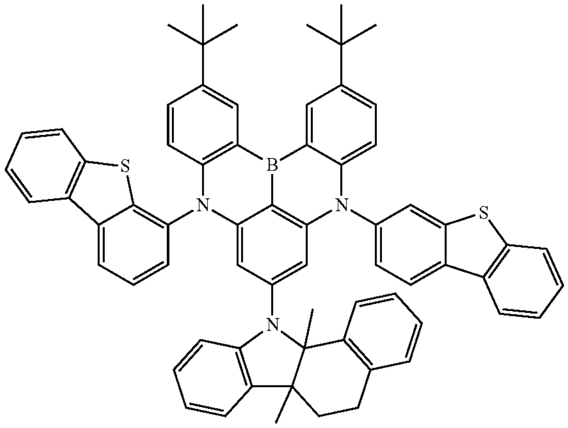
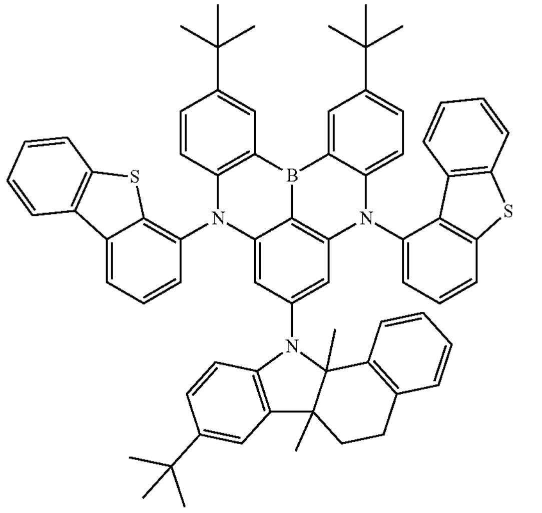
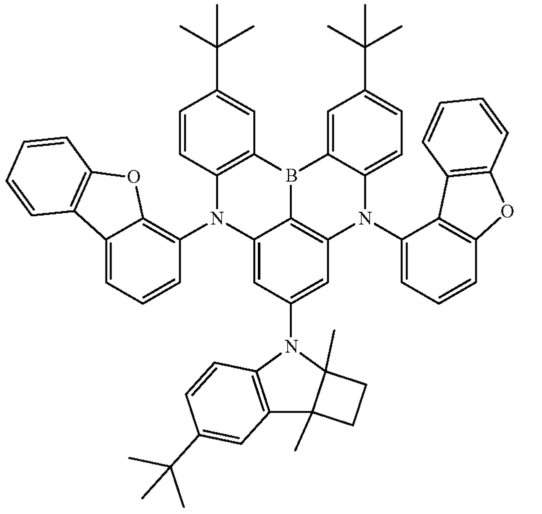

-continued
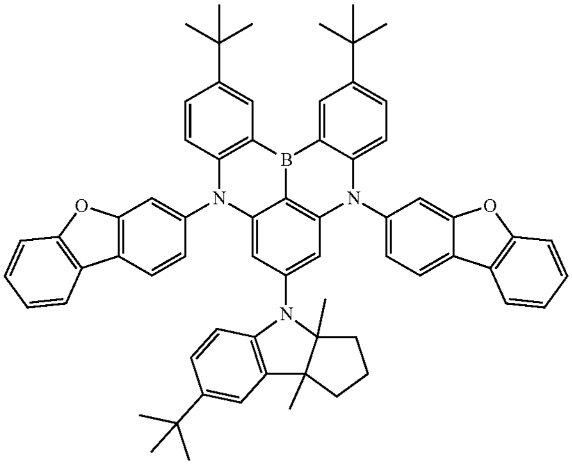
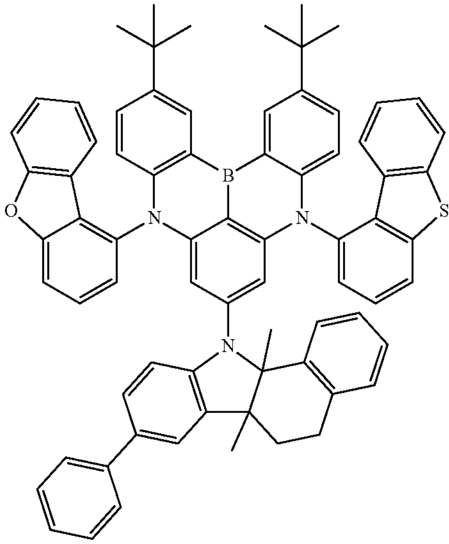
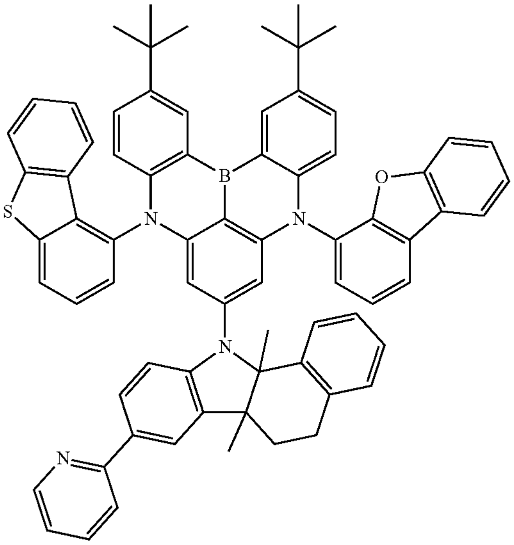
-continued
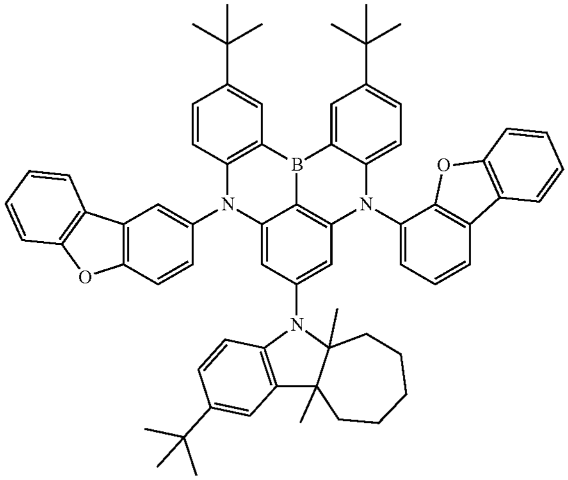
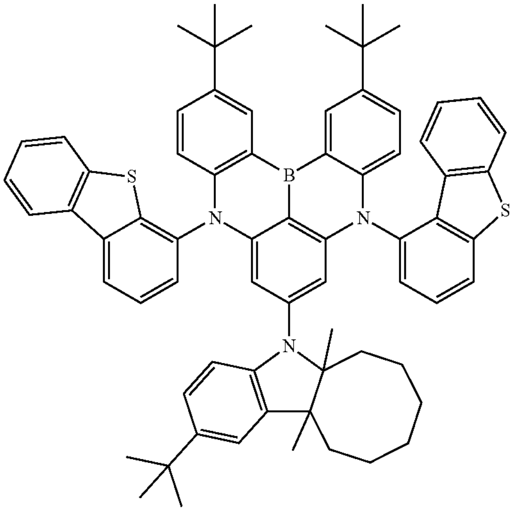
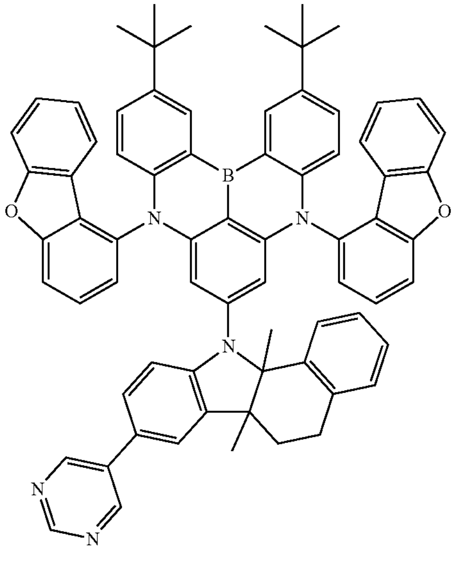

-continued
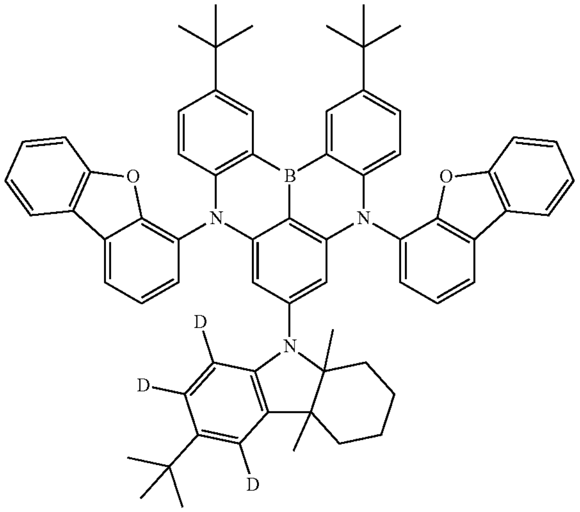
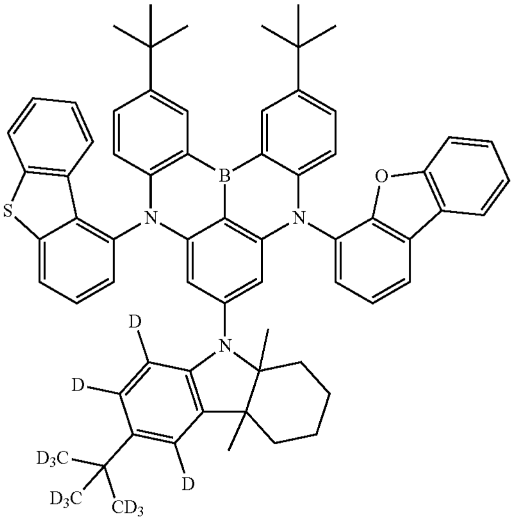
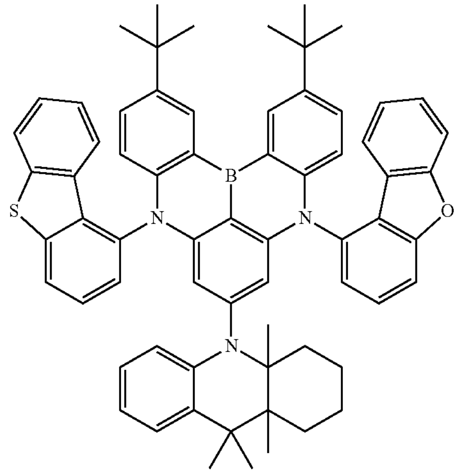
-continued
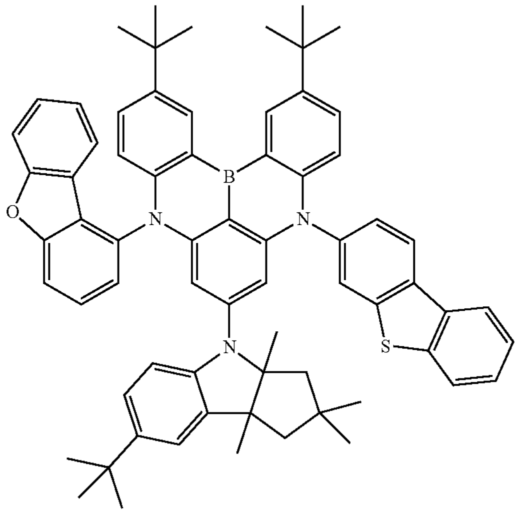
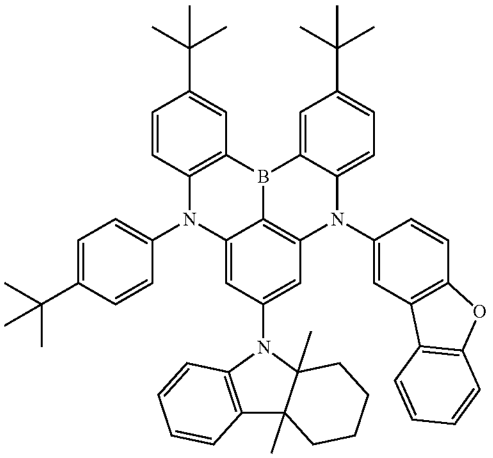
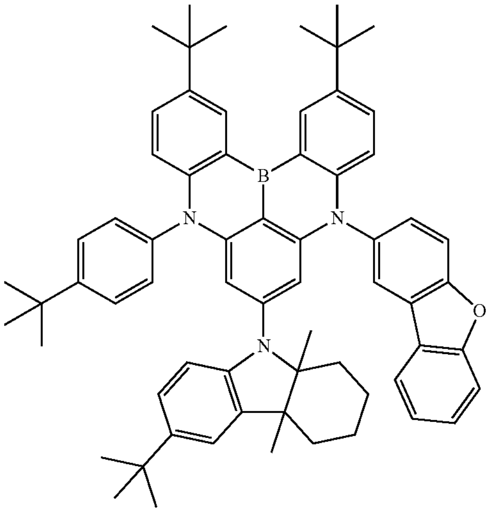

-continued
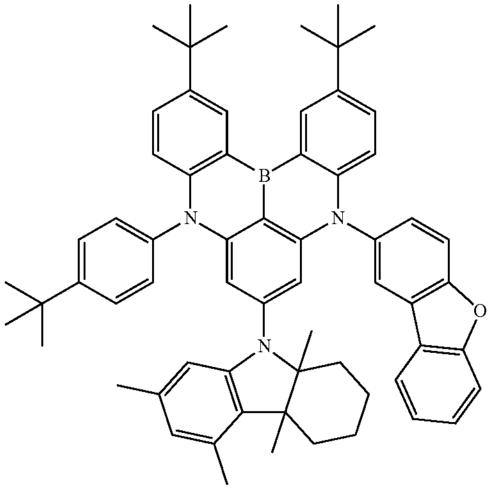
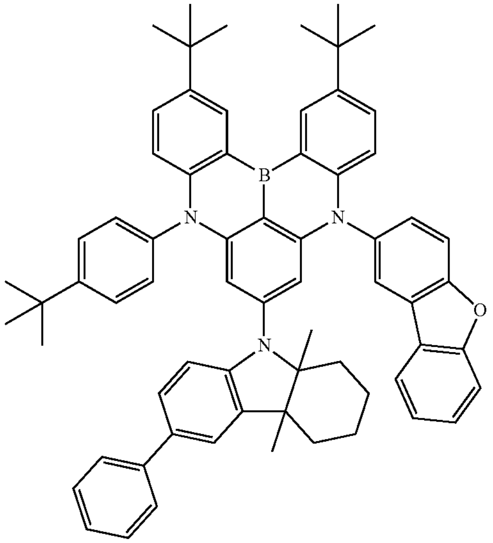
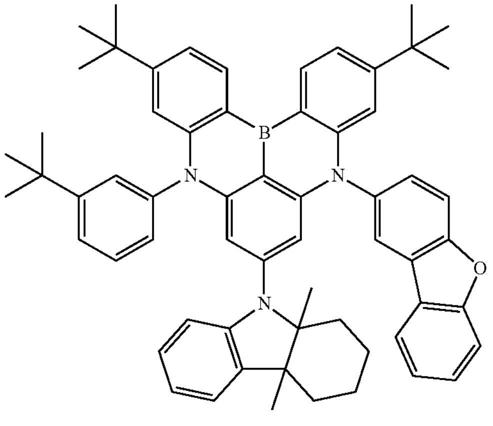
-continued
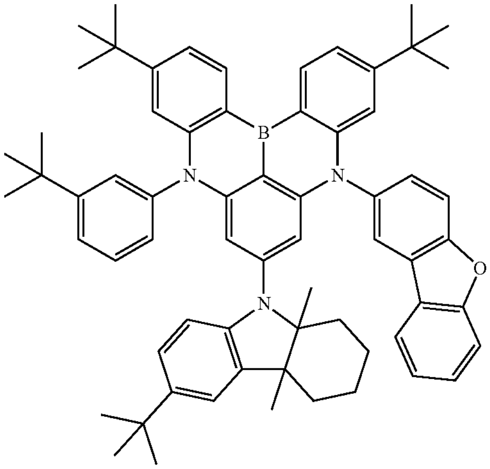
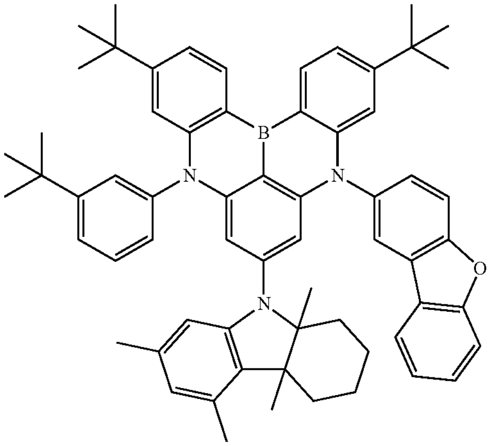
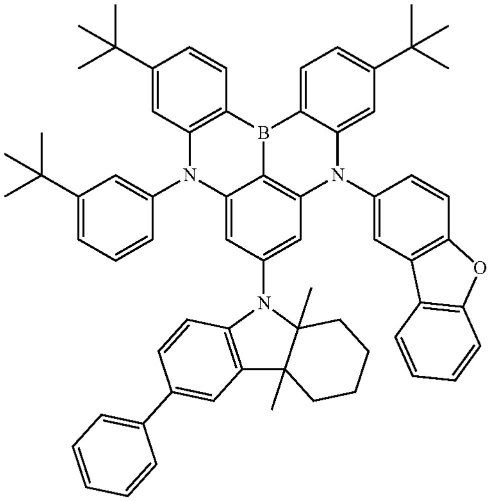

-continued
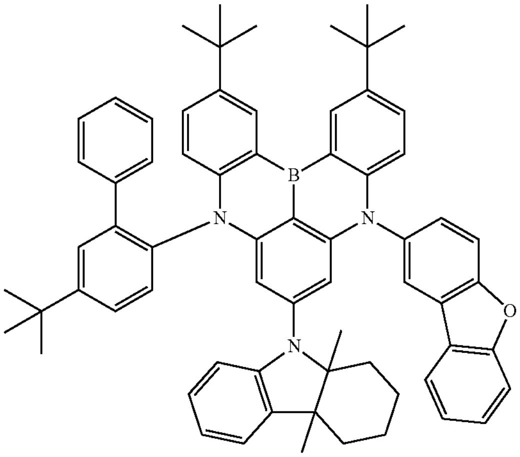
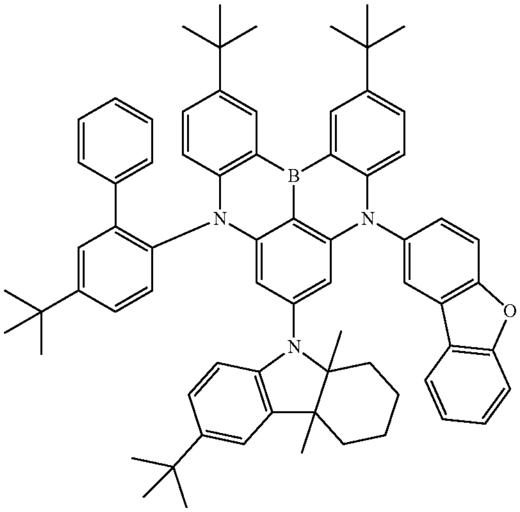
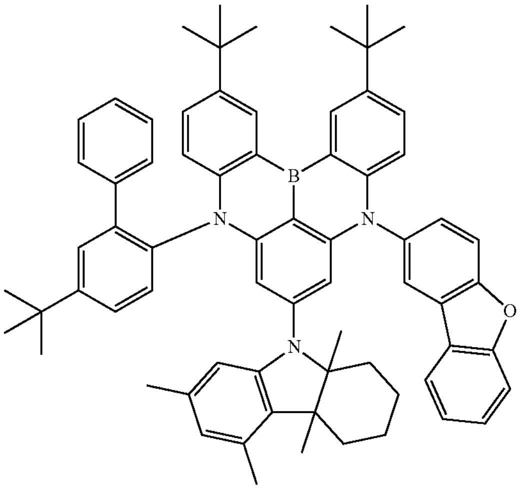
-continued
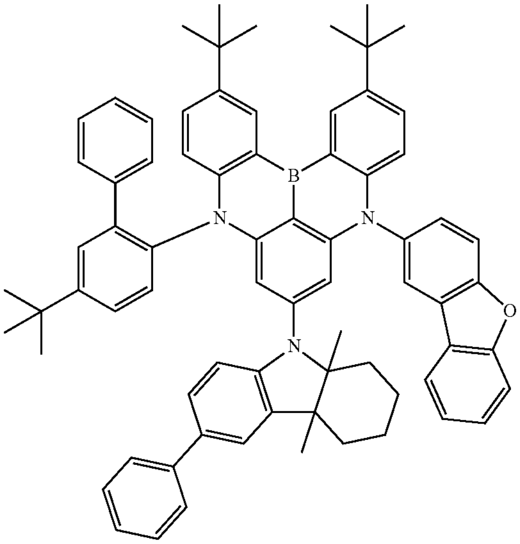
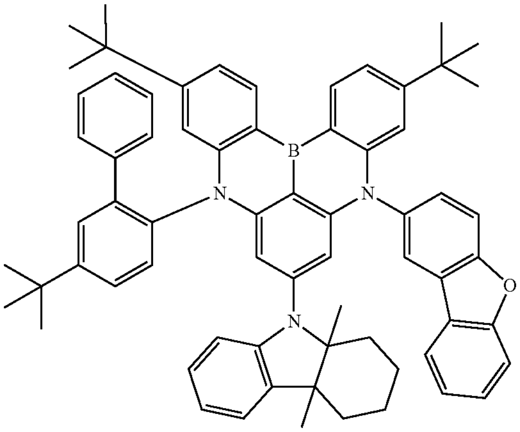
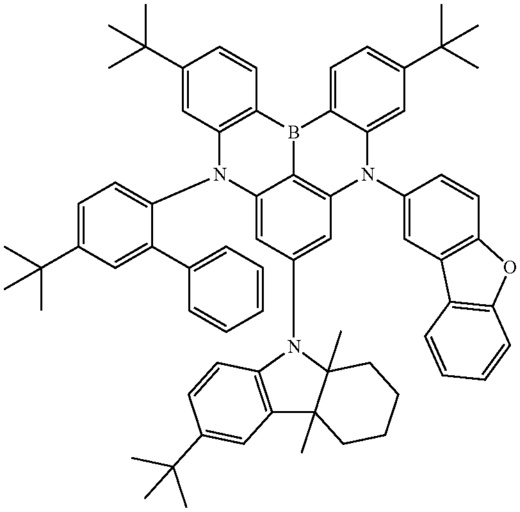

-continued
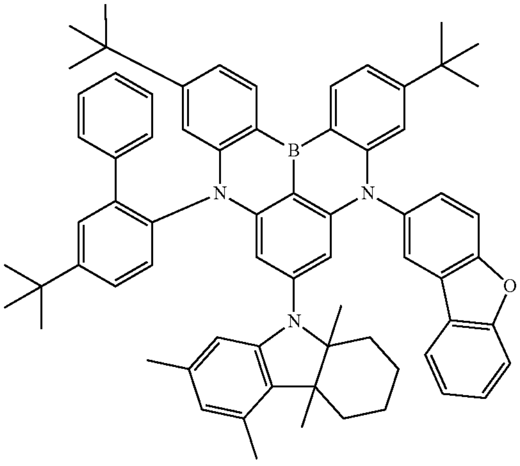
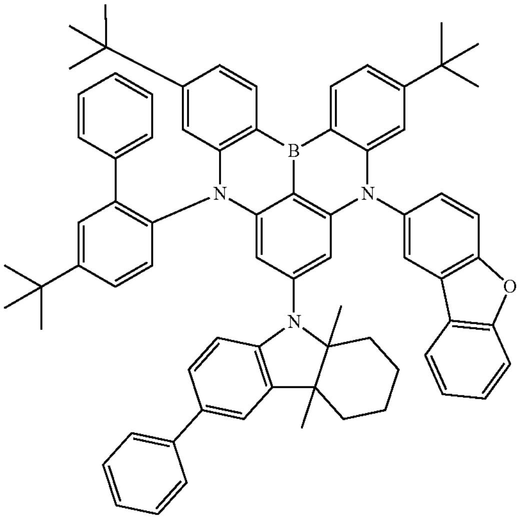
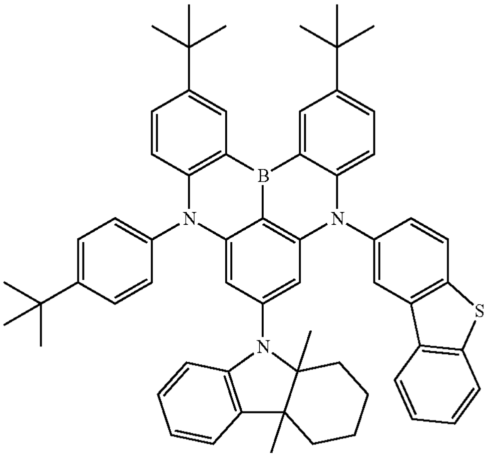
-continued
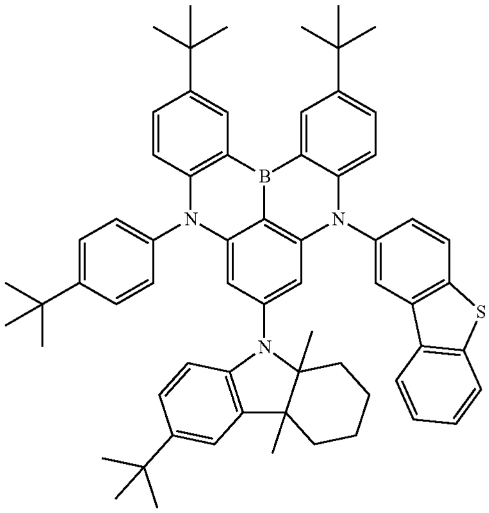
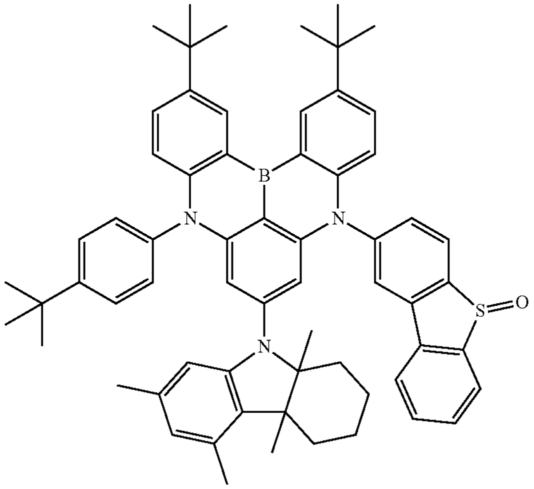
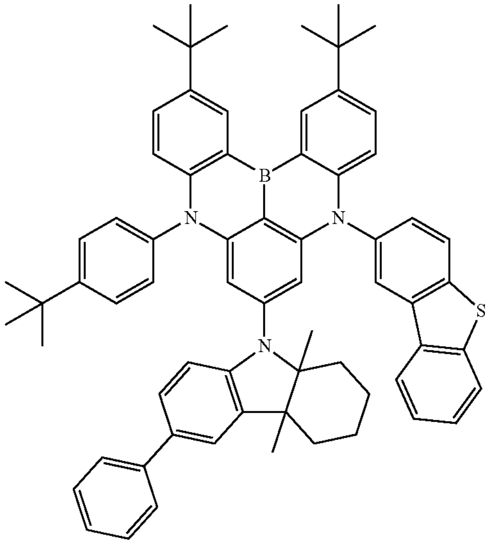

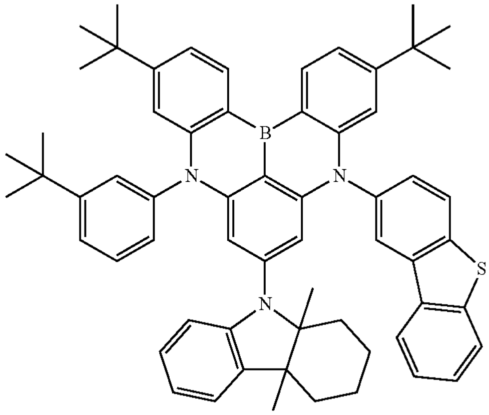
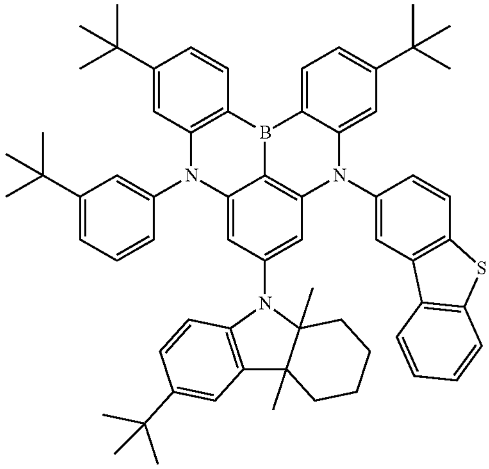
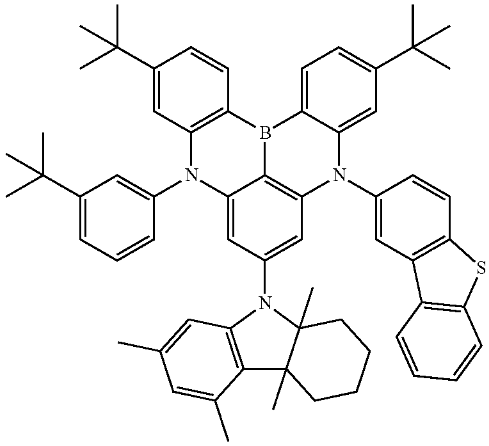
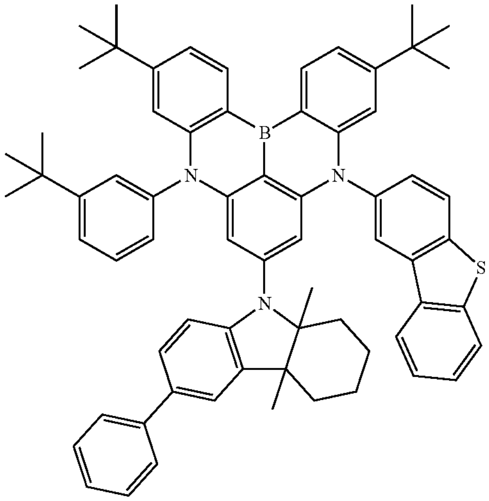
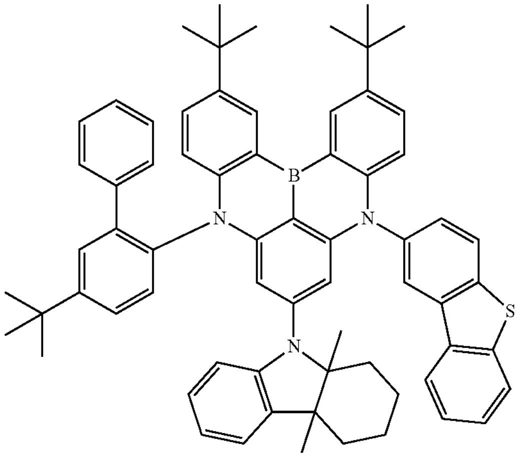
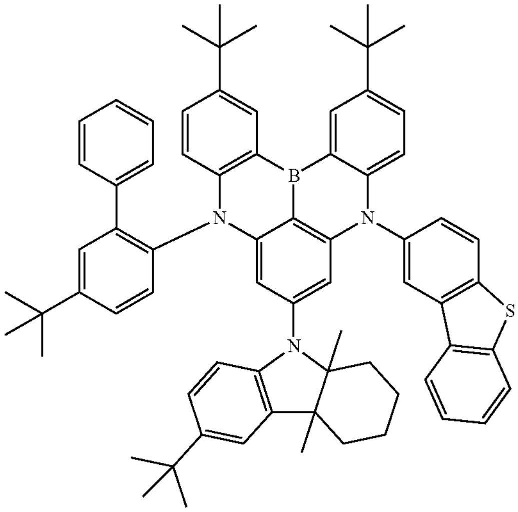

-continued
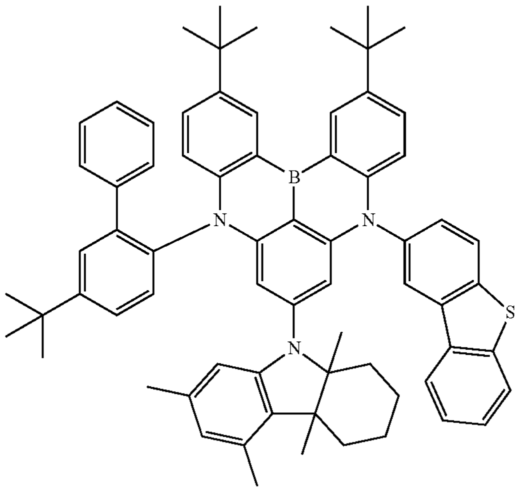
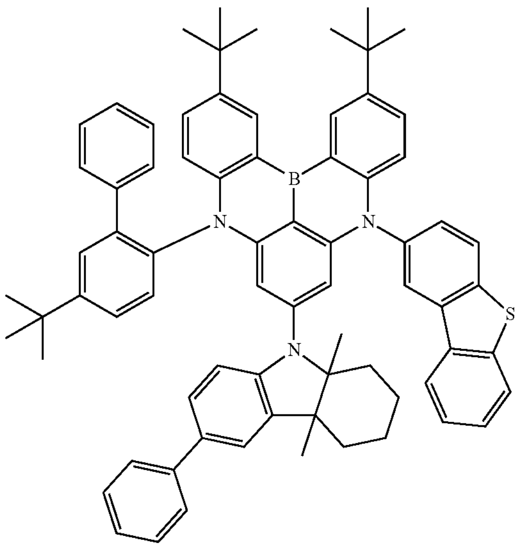
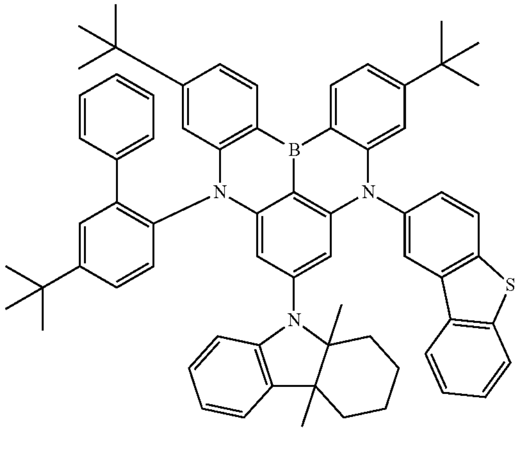
-continued
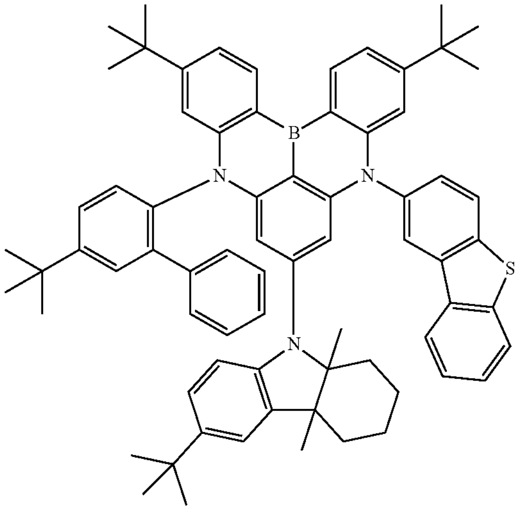
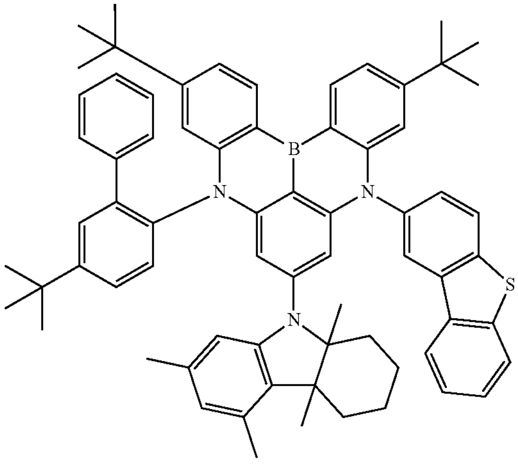
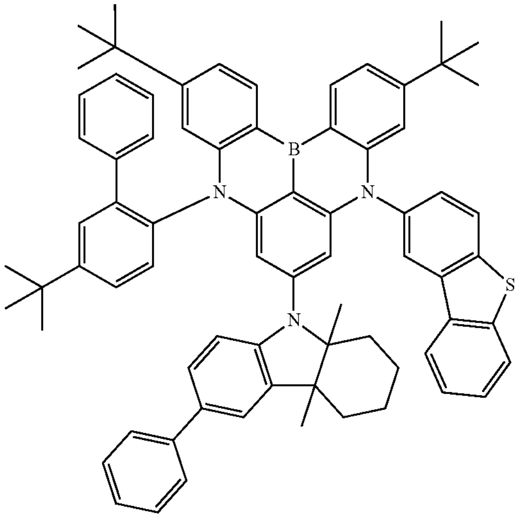

-continued
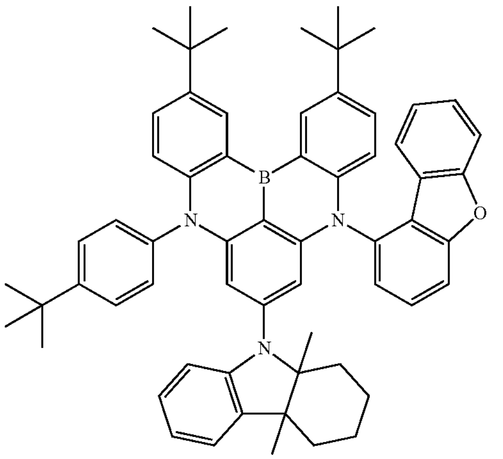
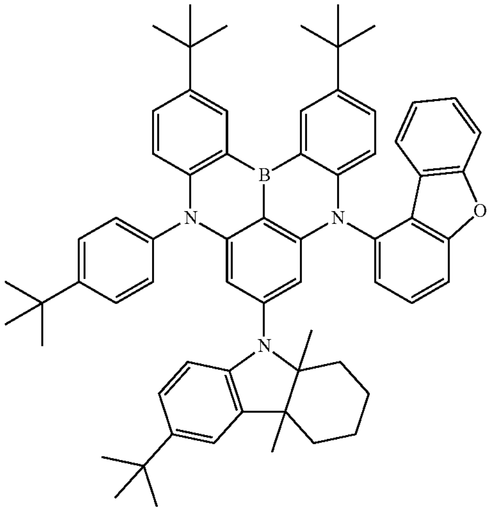
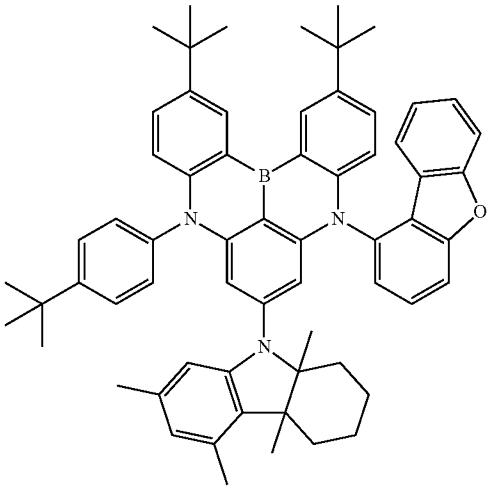
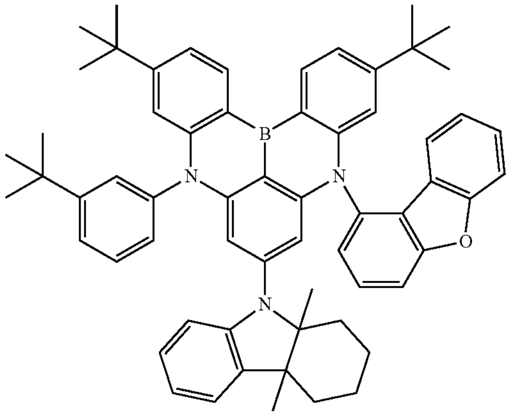
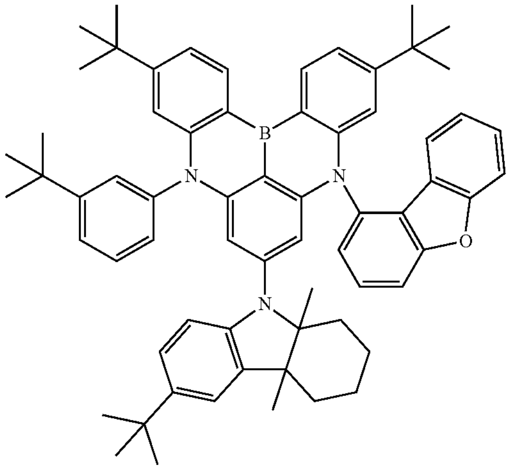
-continued
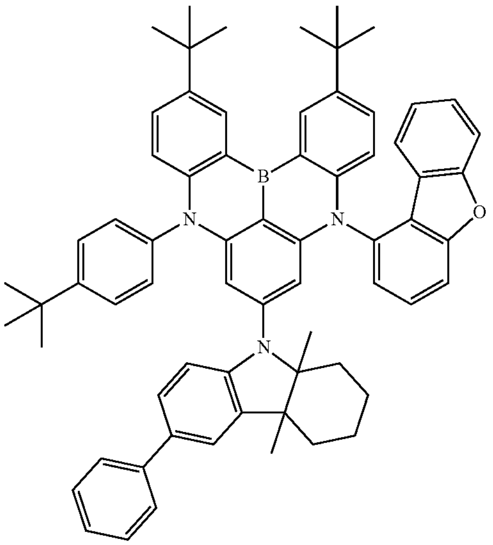

-continued
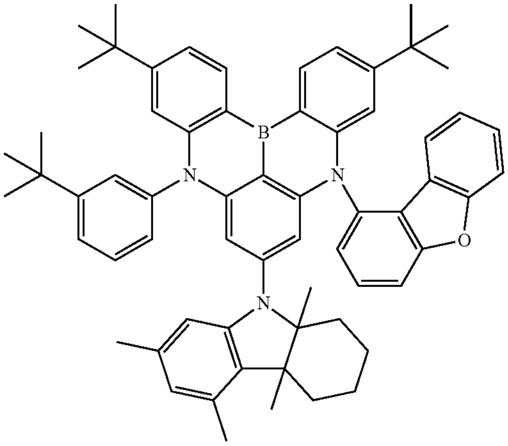
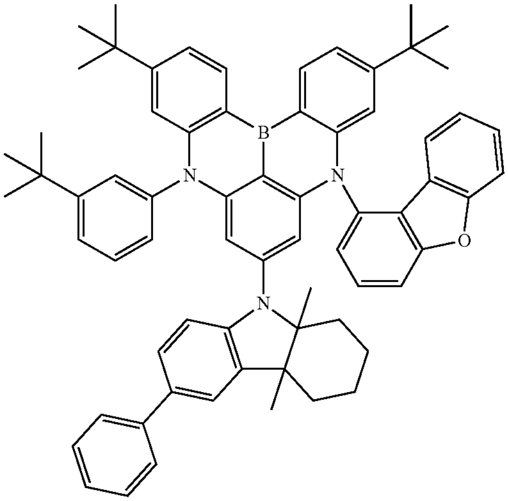
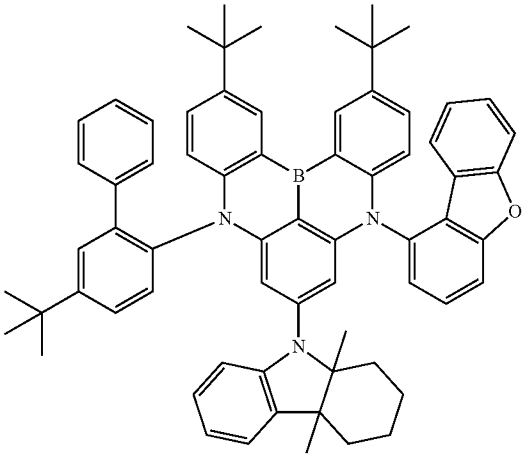
-continued
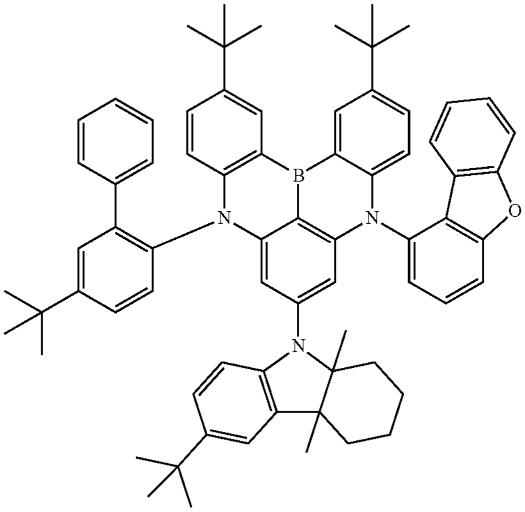
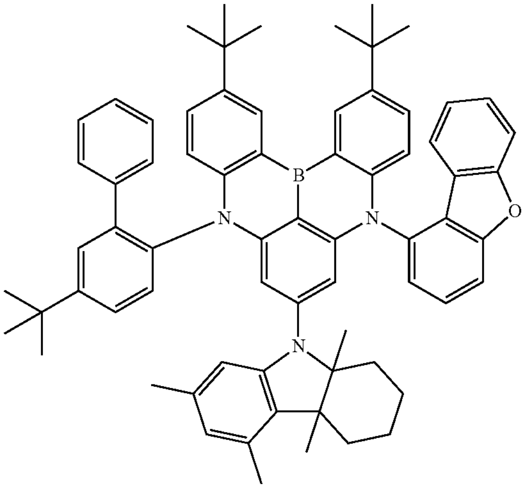
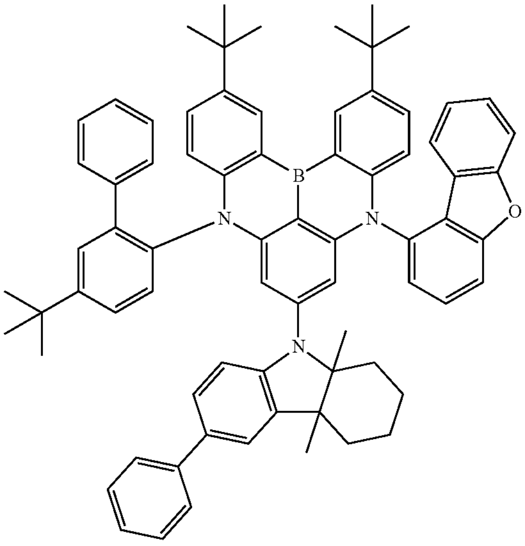

-continued
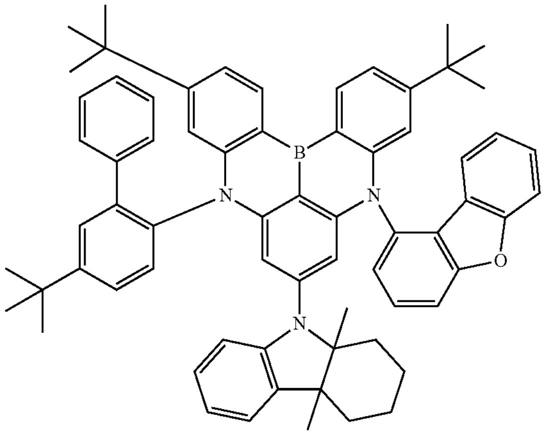
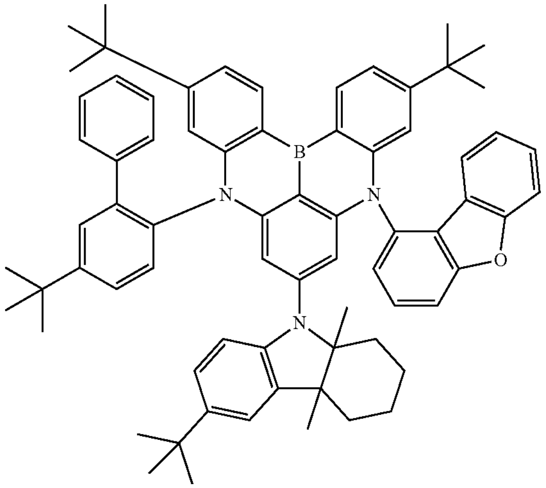
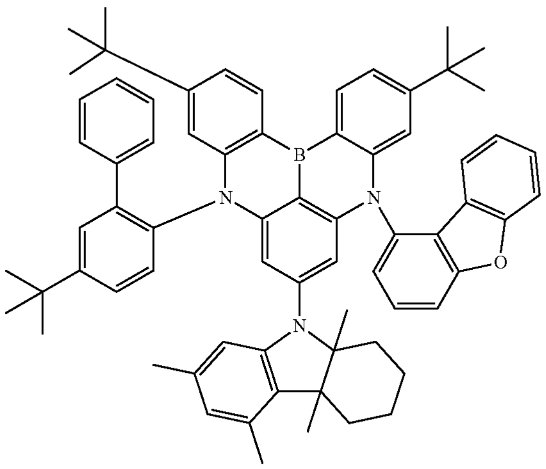
-continued
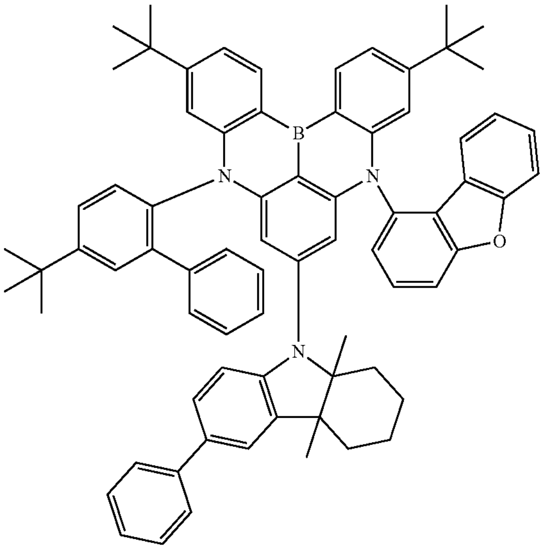
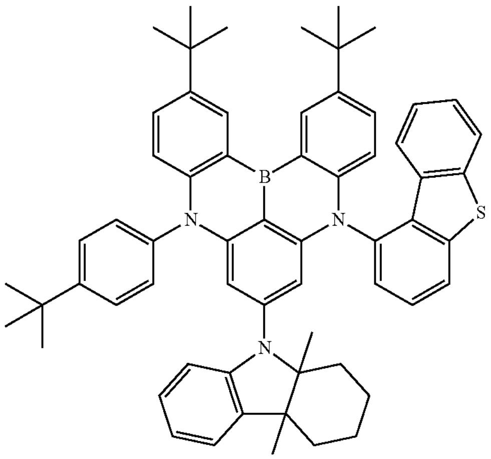
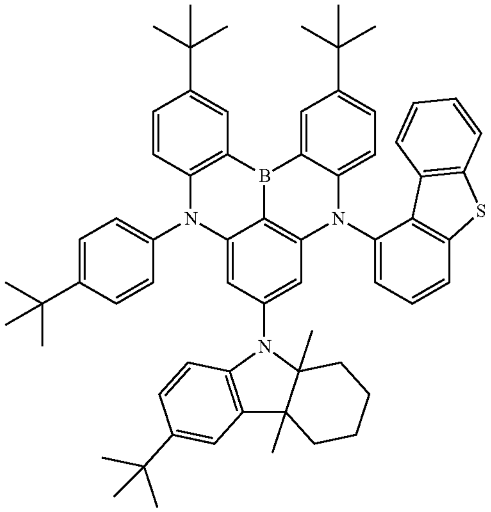

-continued
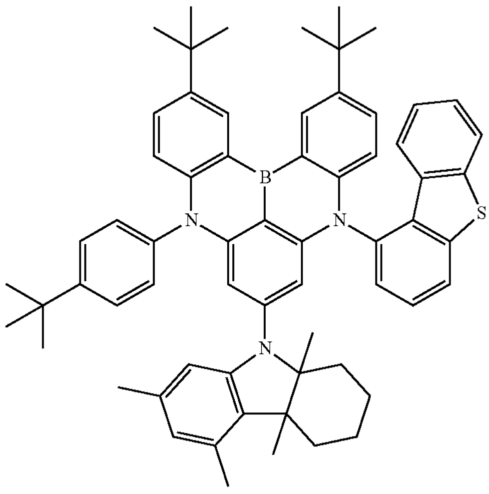
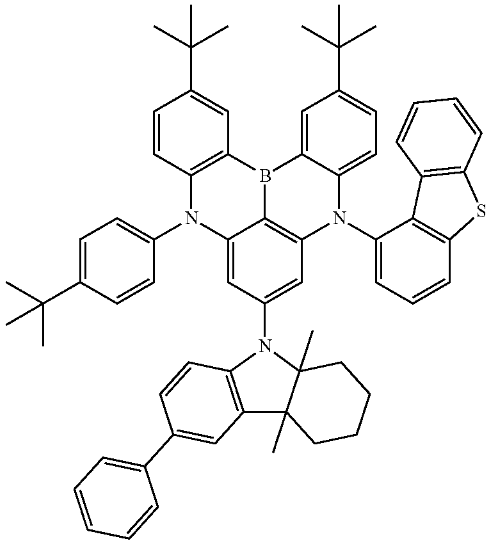
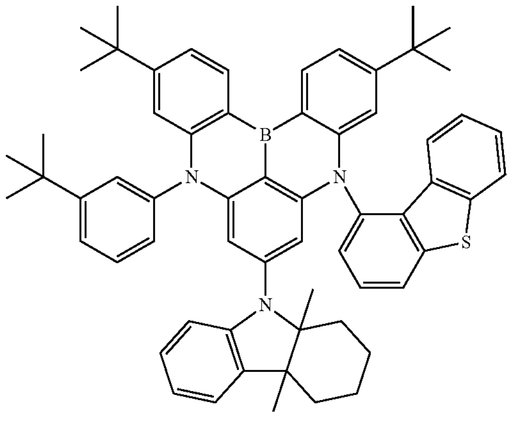
-continued
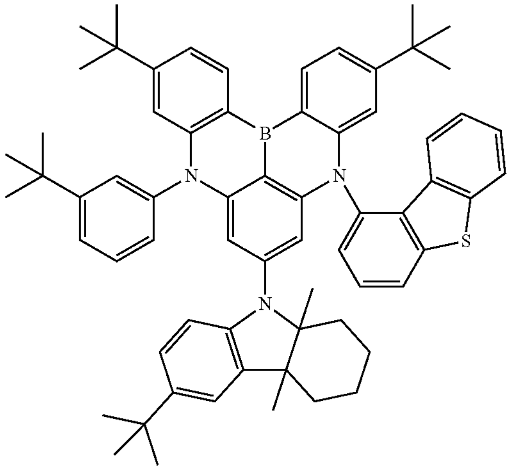
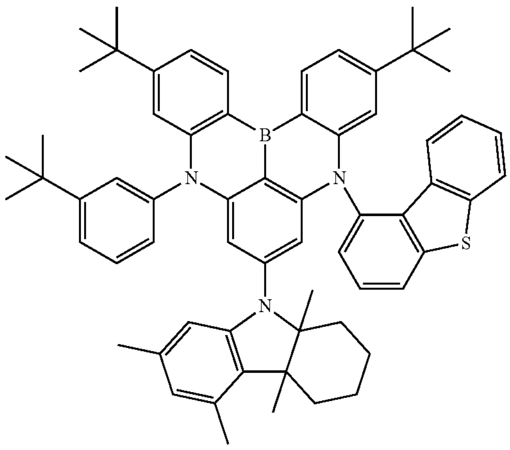
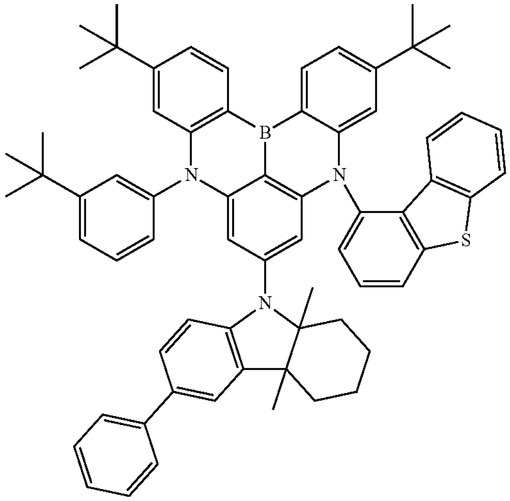

-continued
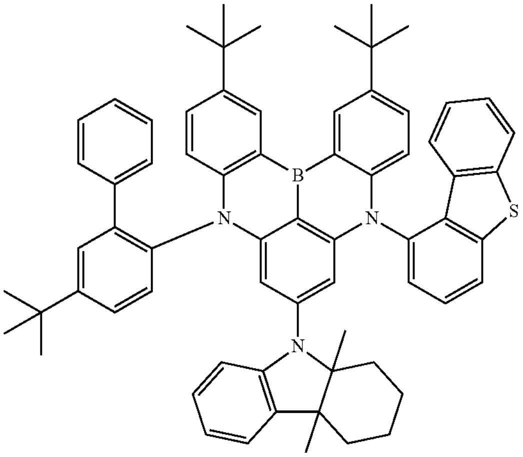
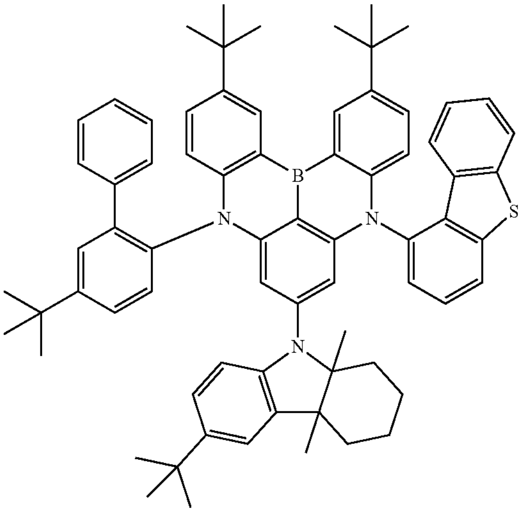
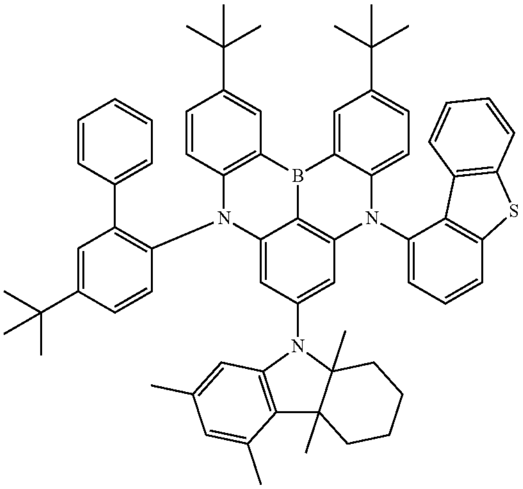
-continued
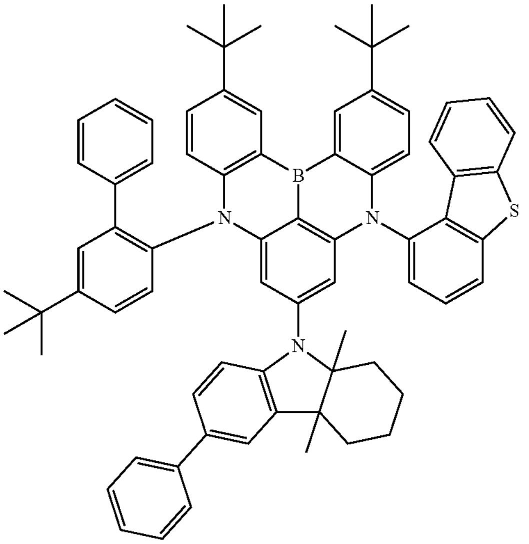
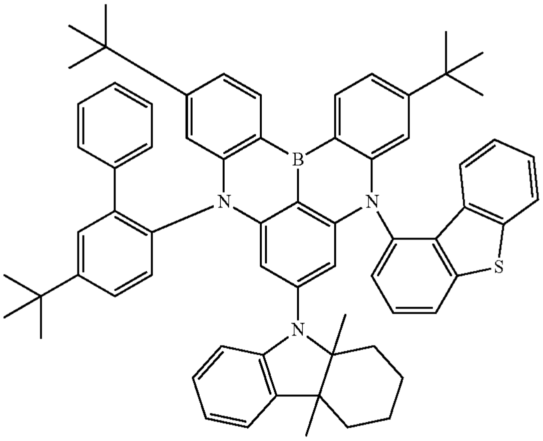
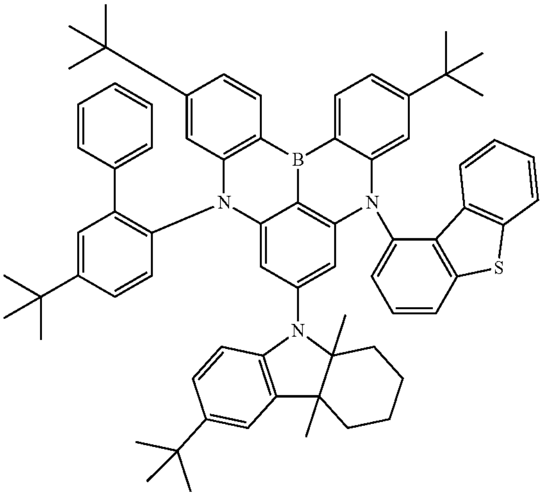

-continued
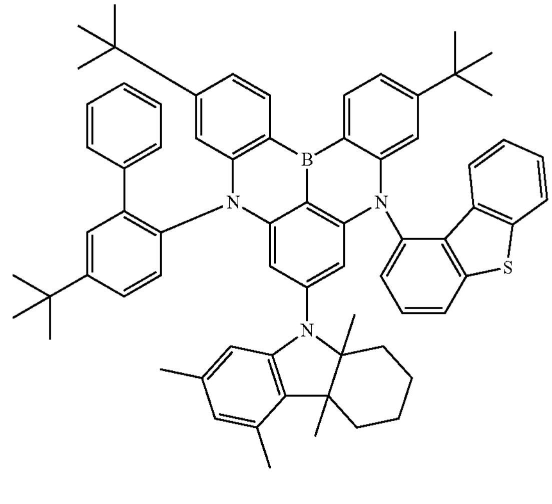
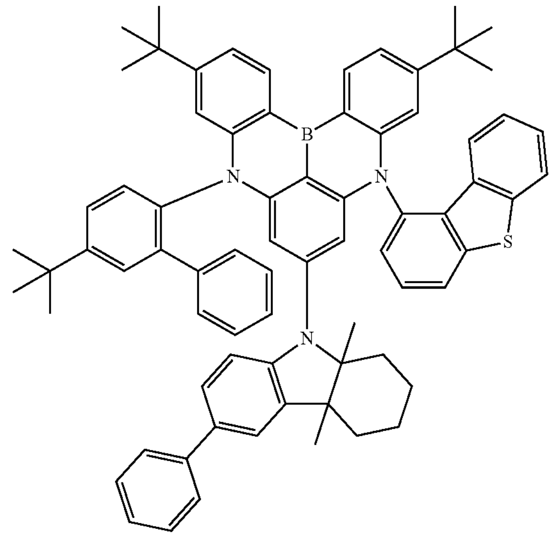
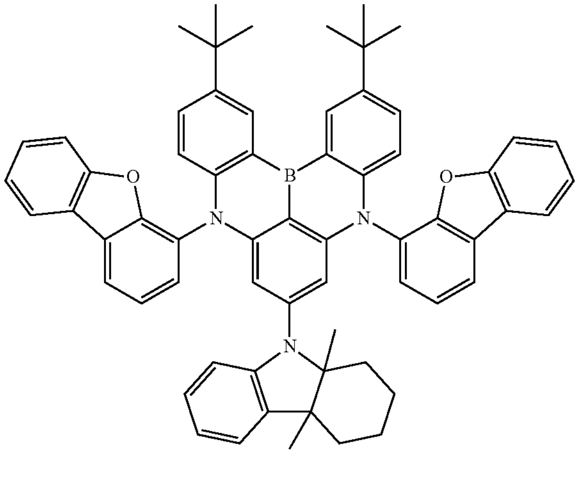
-continued
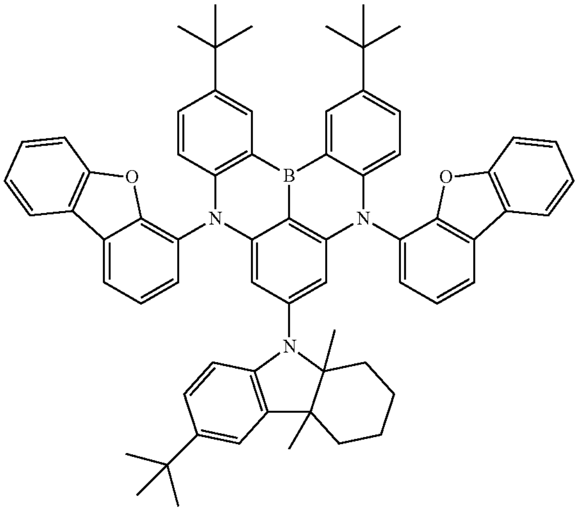
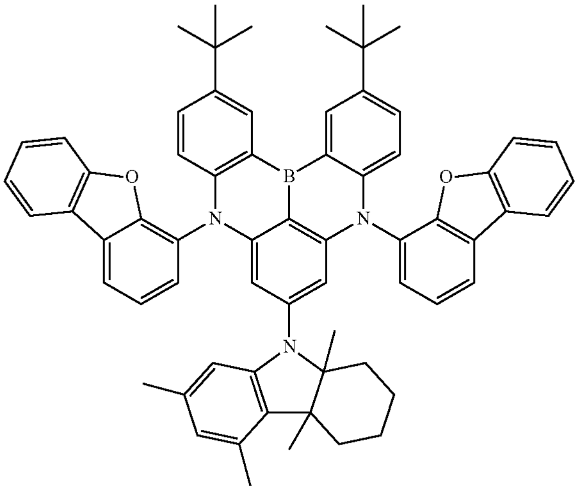
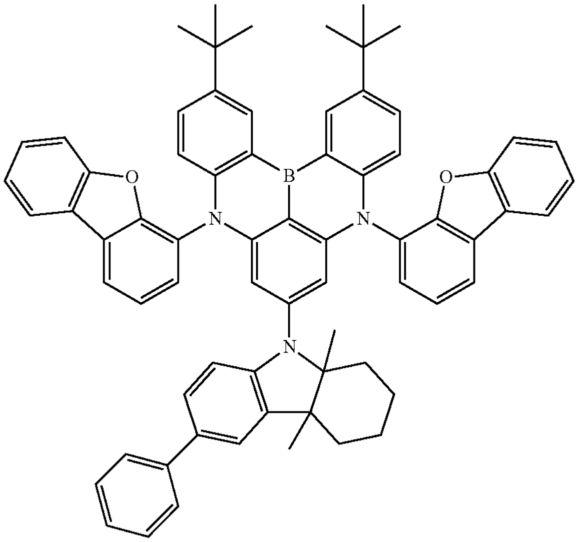

-continued
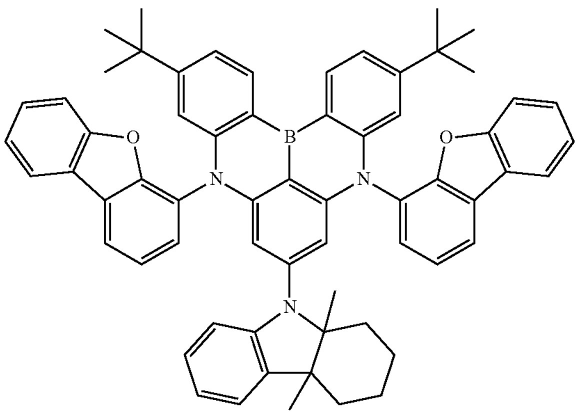
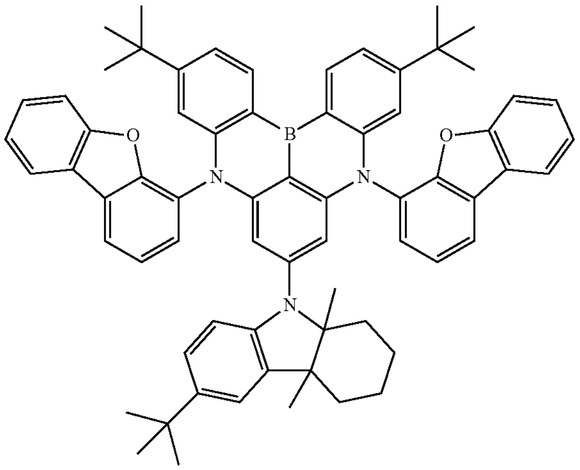
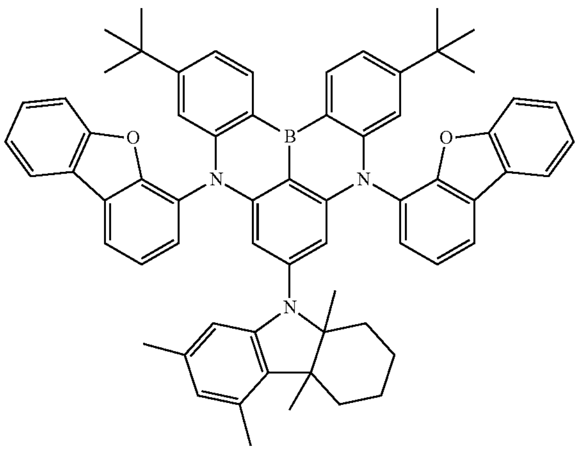
-continued
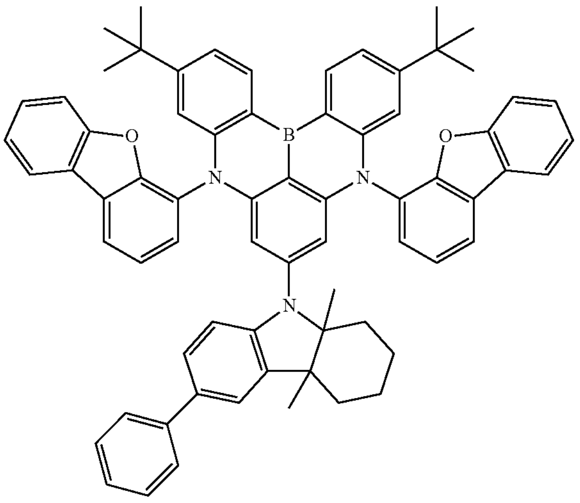
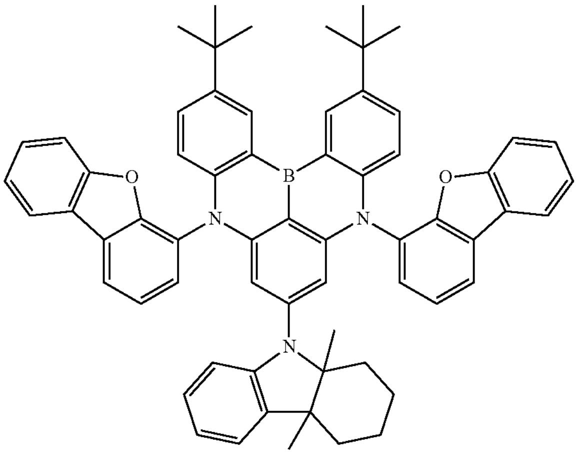
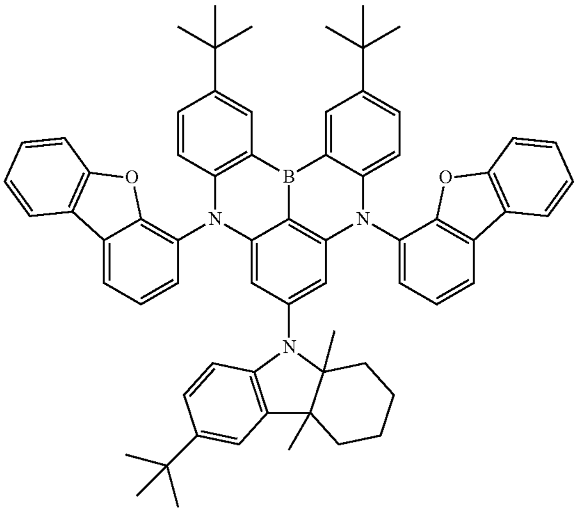

-continued
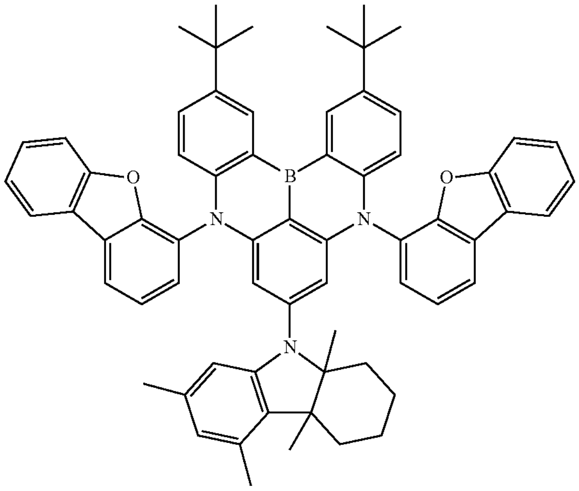
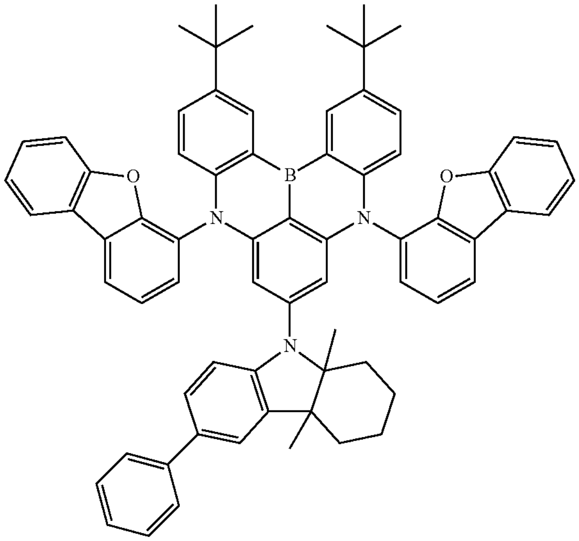
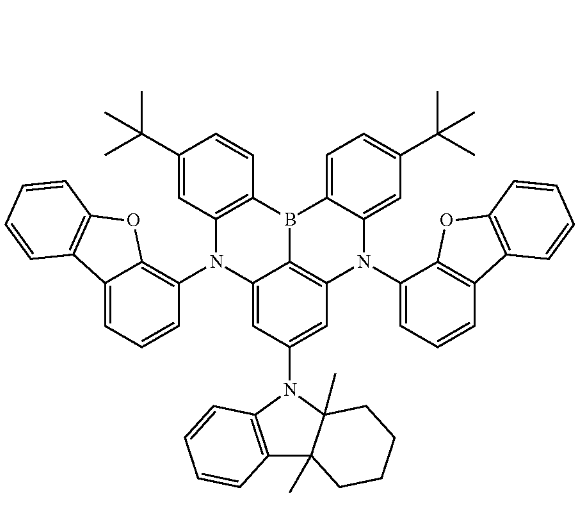
-continued
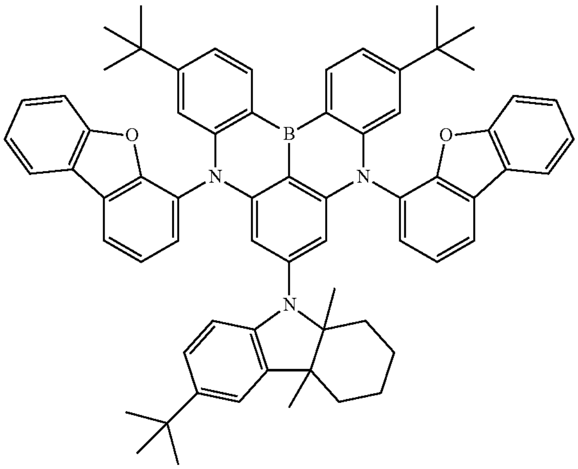
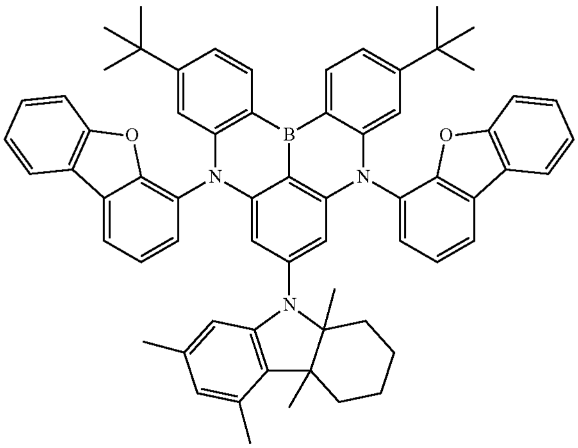
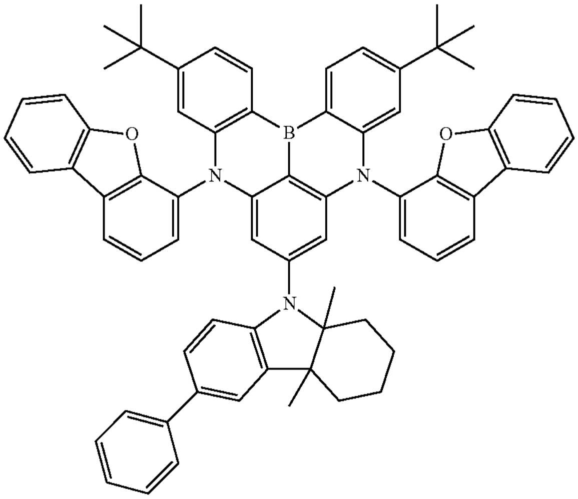

-continued
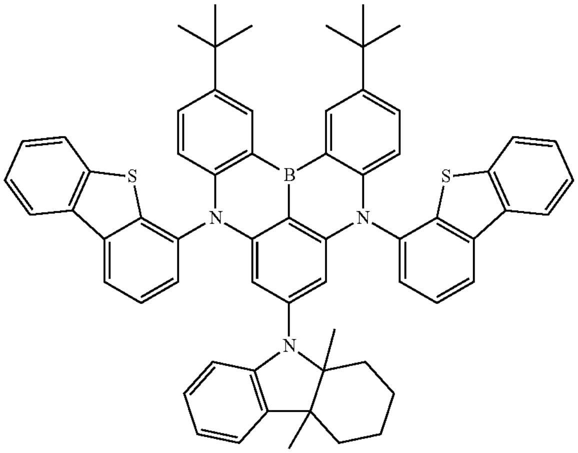
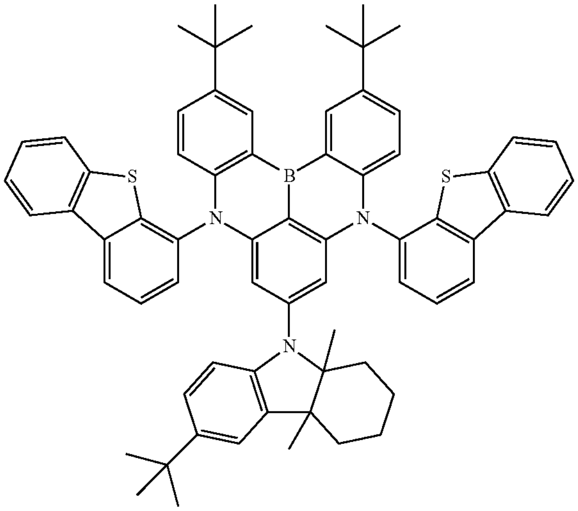
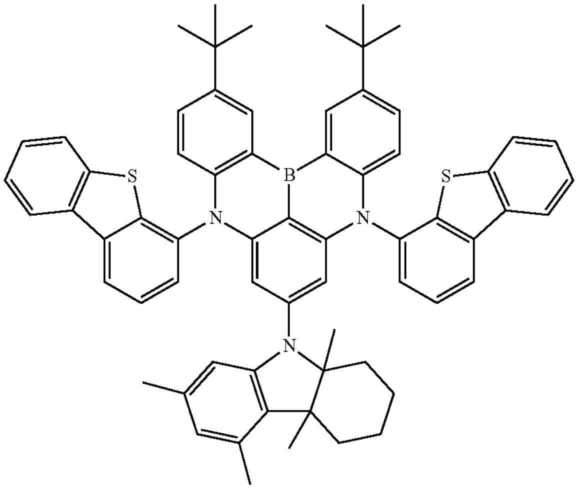
-continued
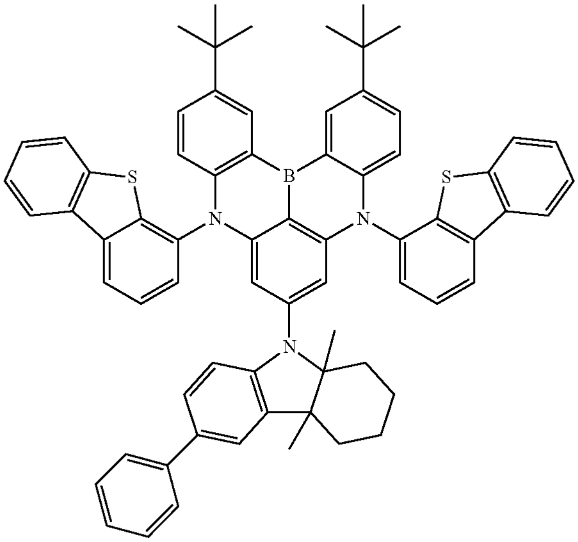
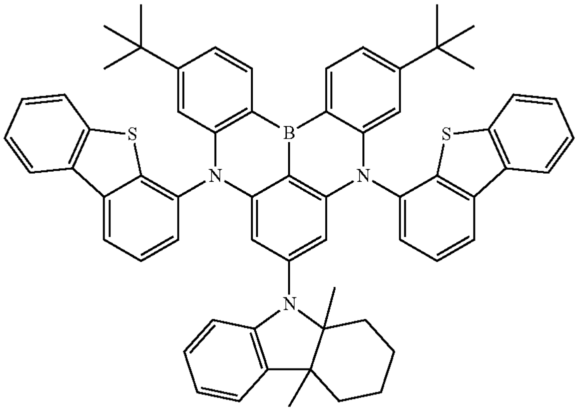
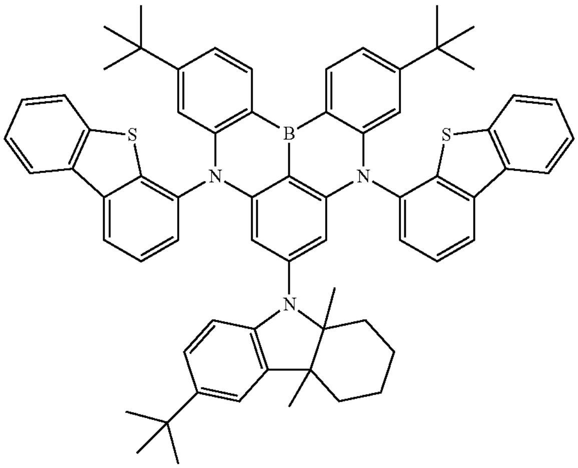

-continued
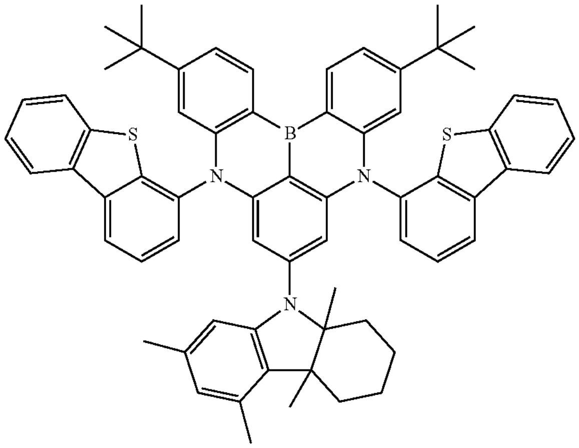
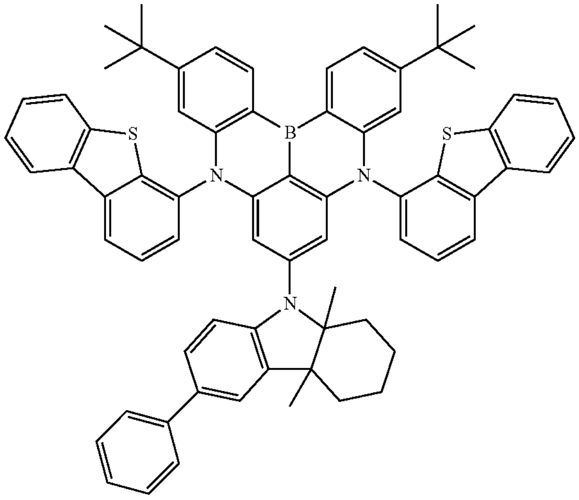
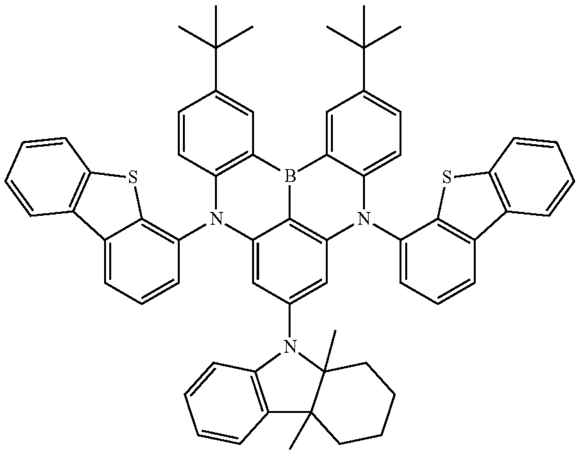
-continued
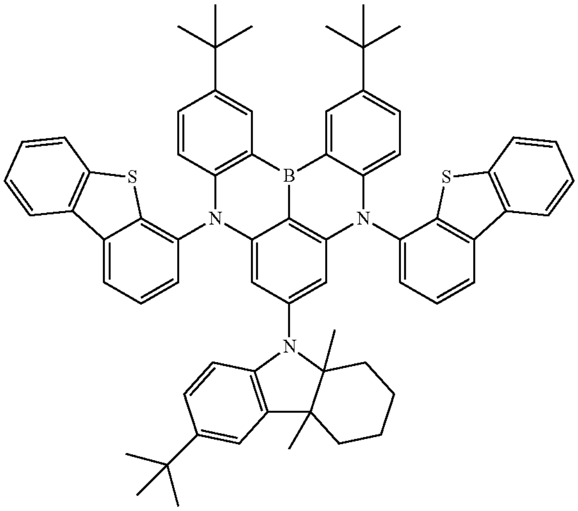
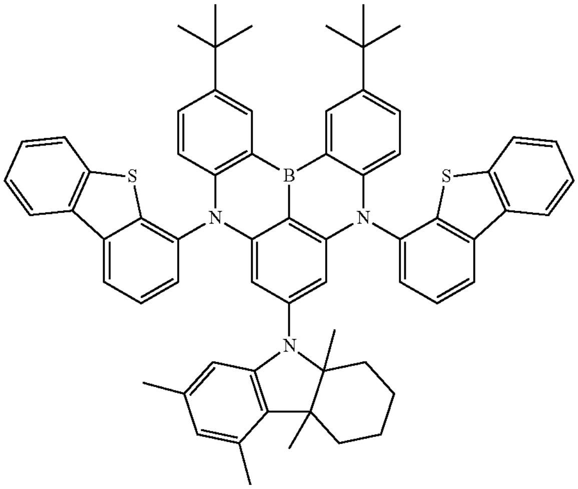
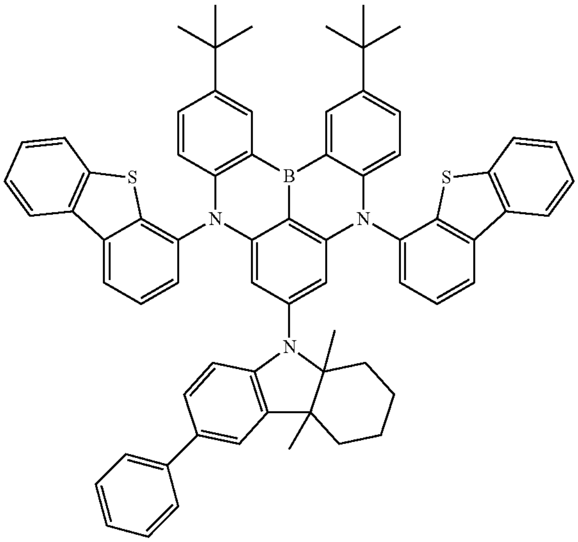

-continued
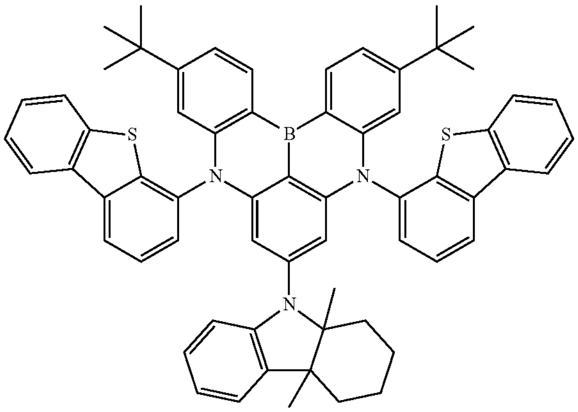
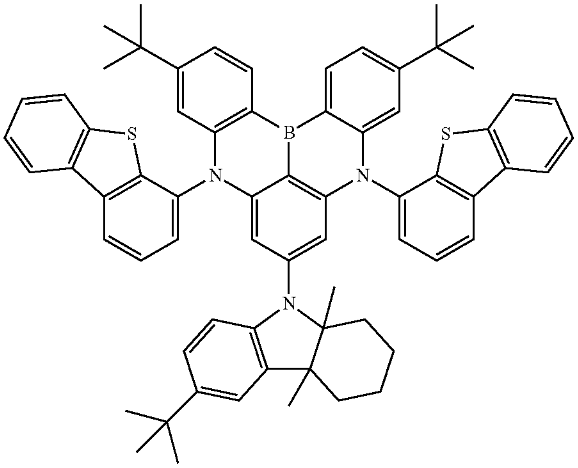
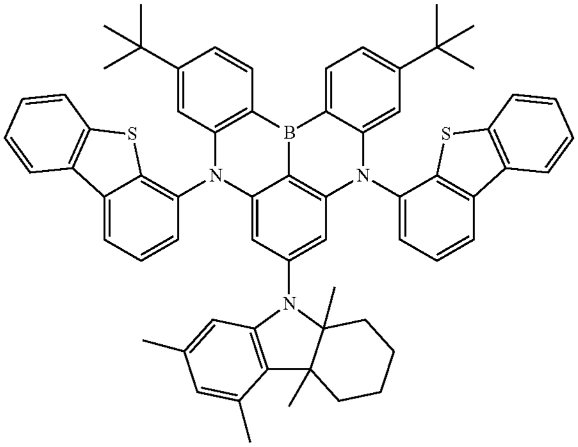
-continued
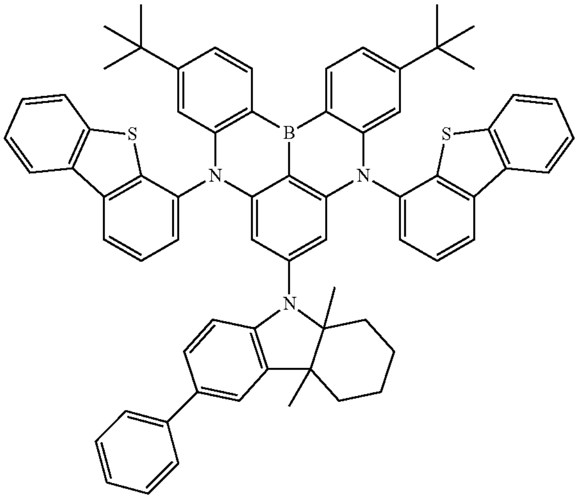
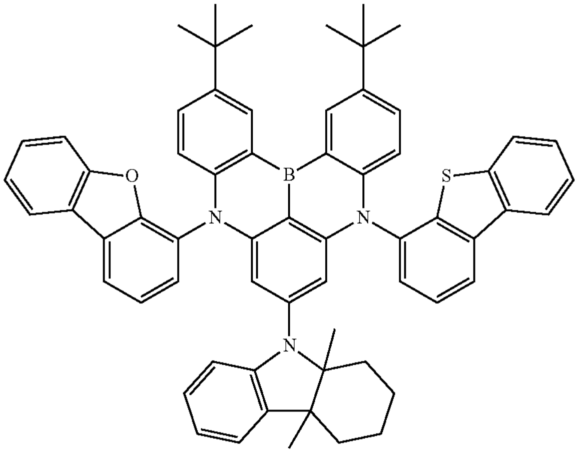
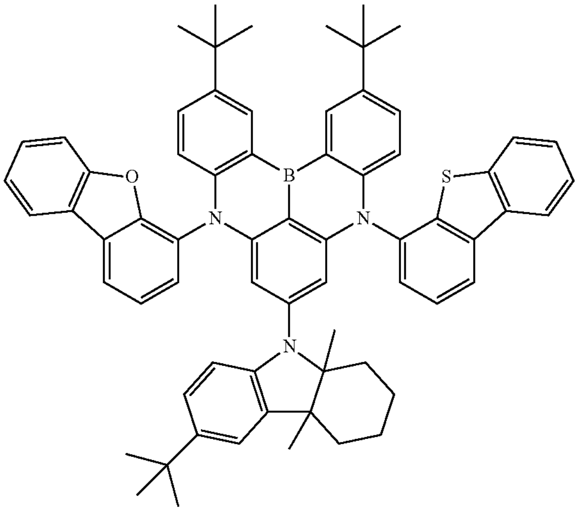

-continued
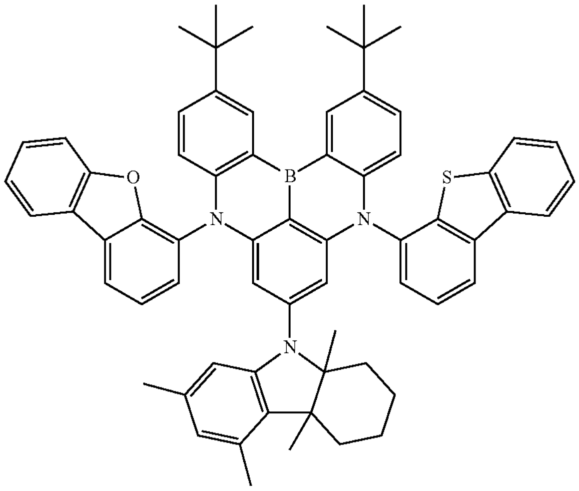
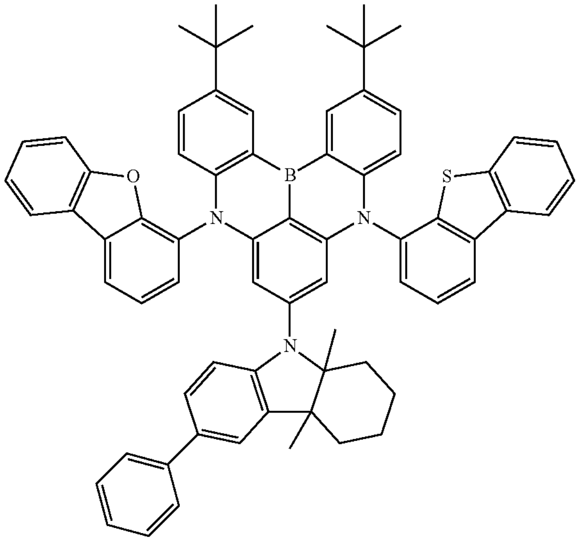
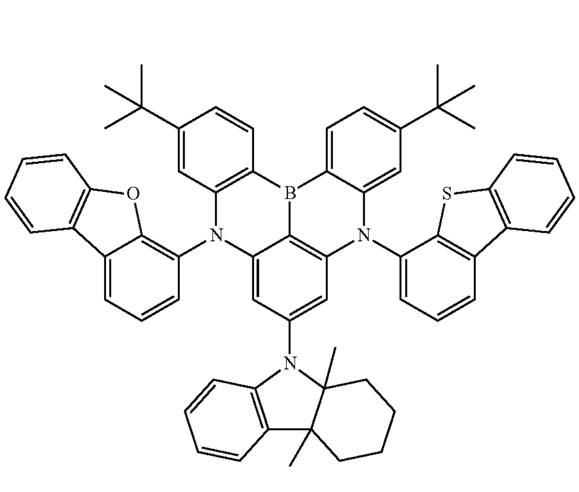
-continued
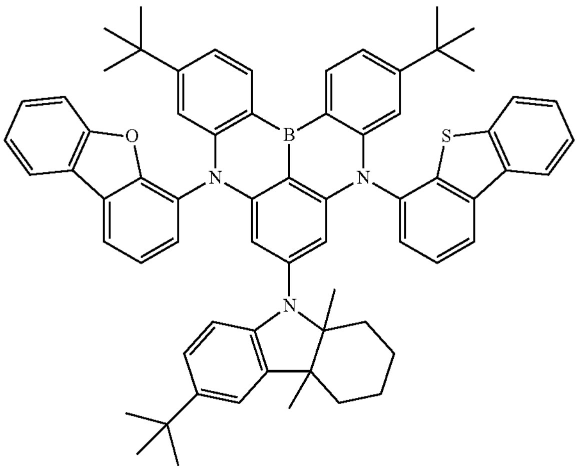
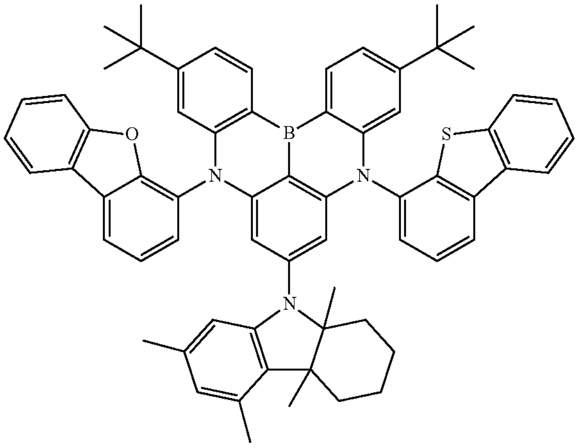
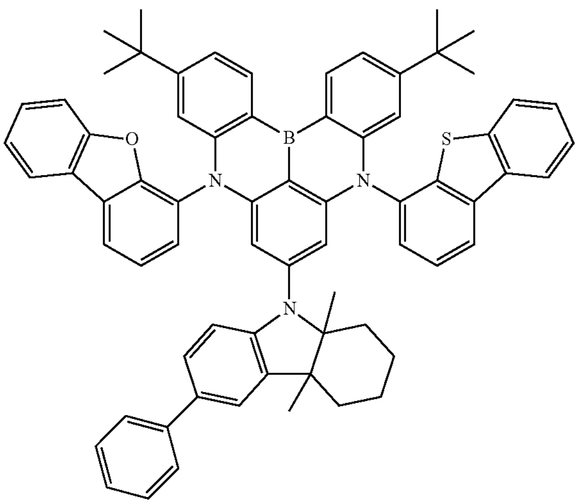

-continued
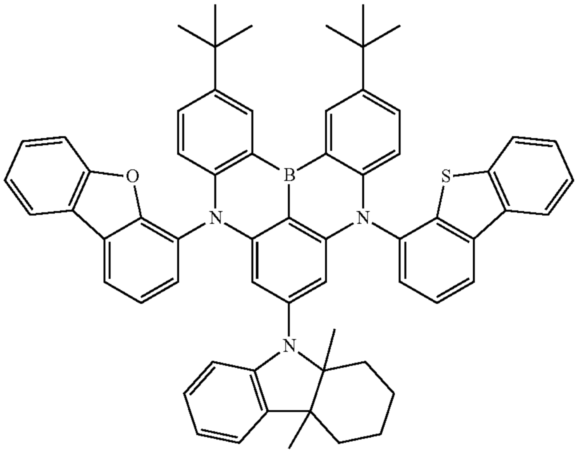
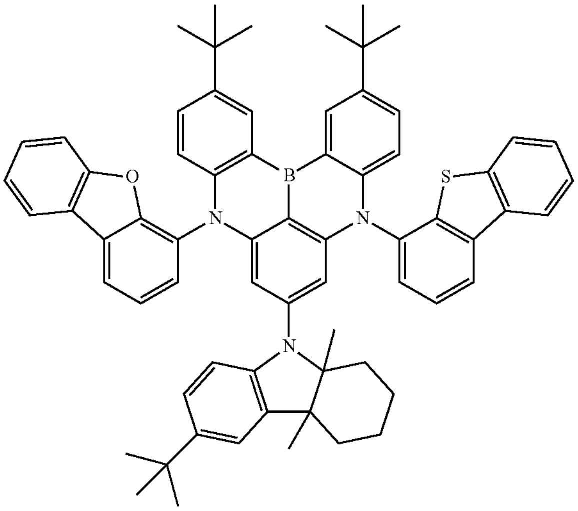
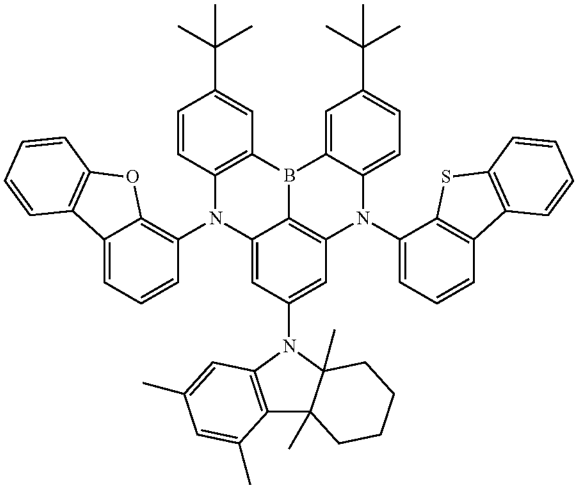
-continued
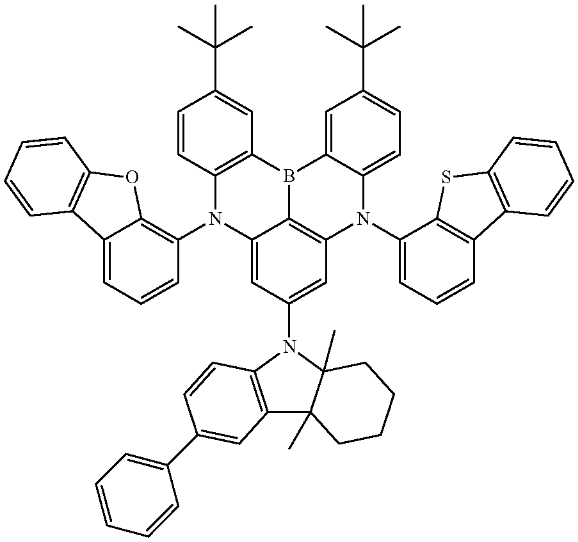
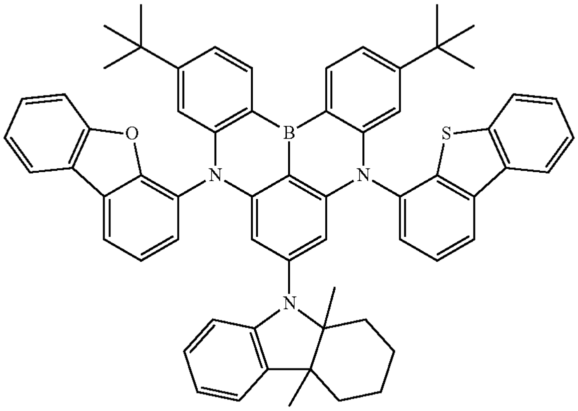
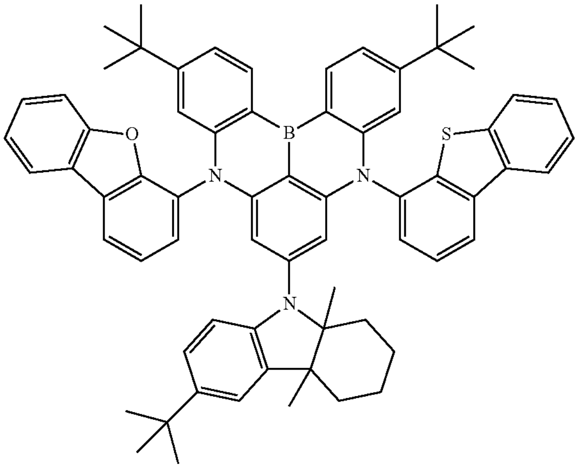

-continued
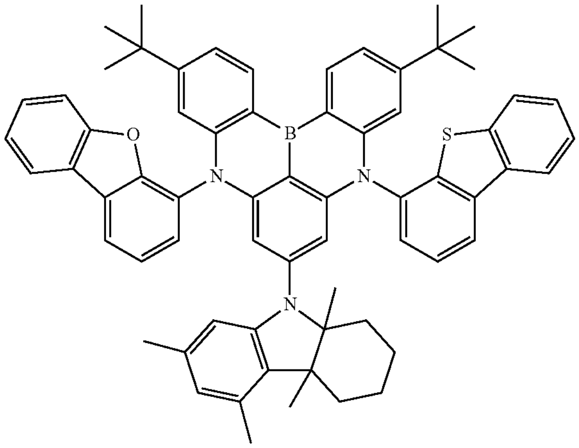
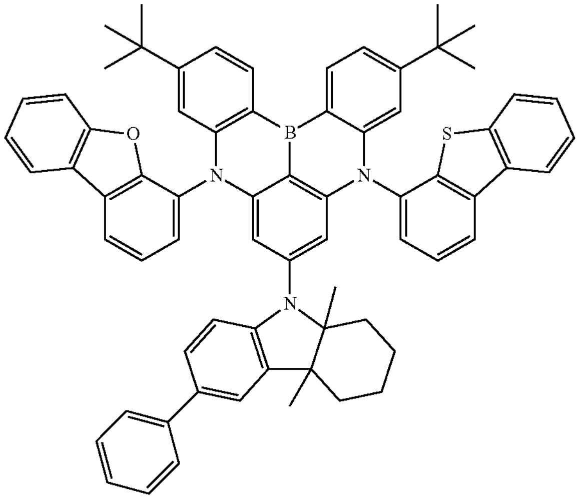
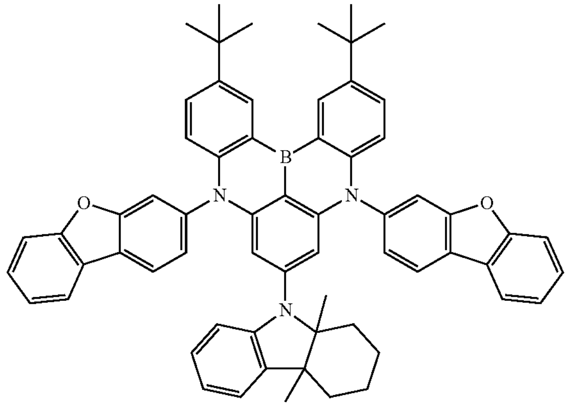
-continued
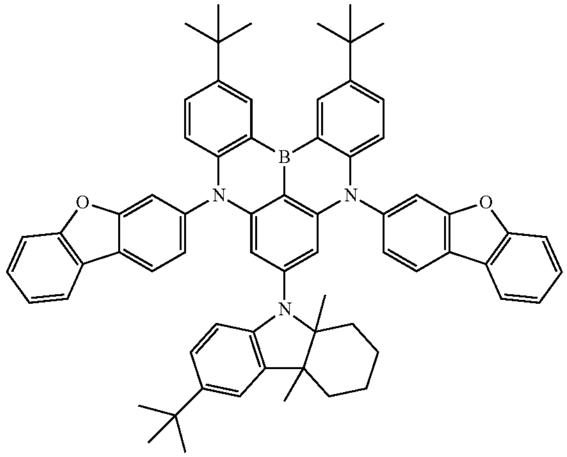
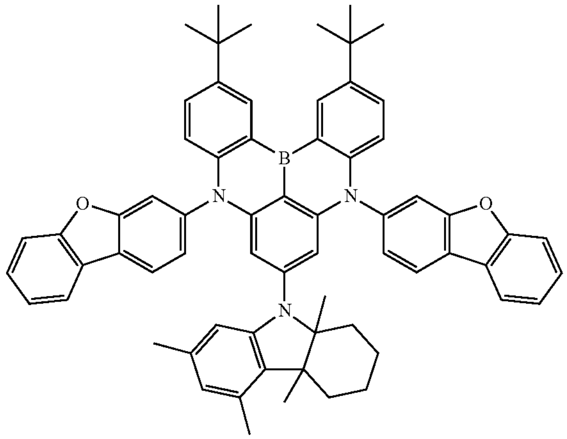
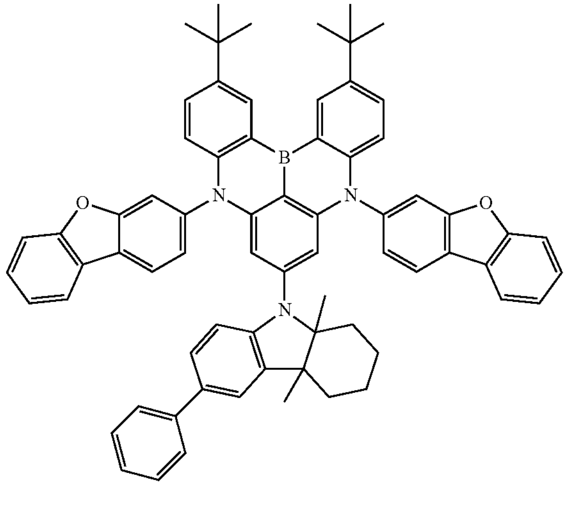

-continued
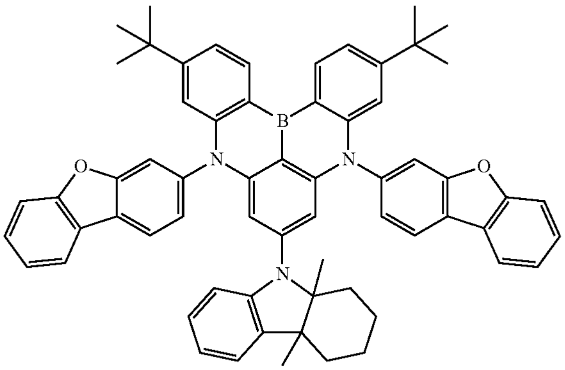
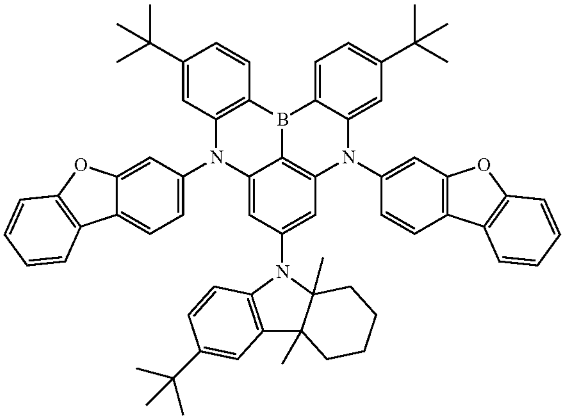
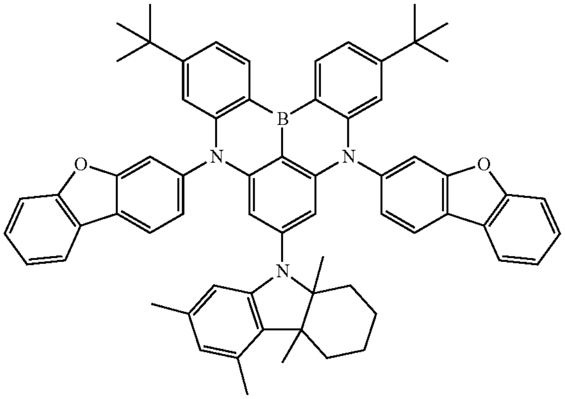
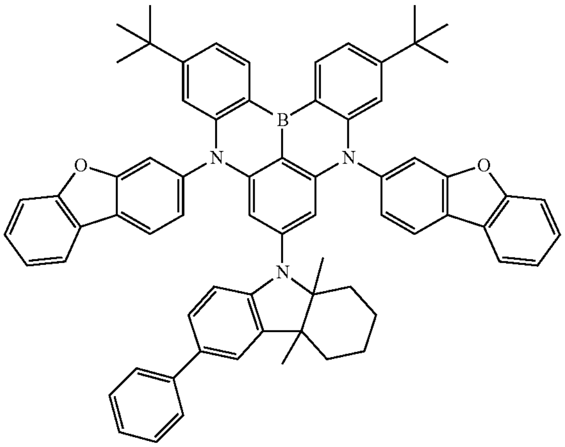
-continued
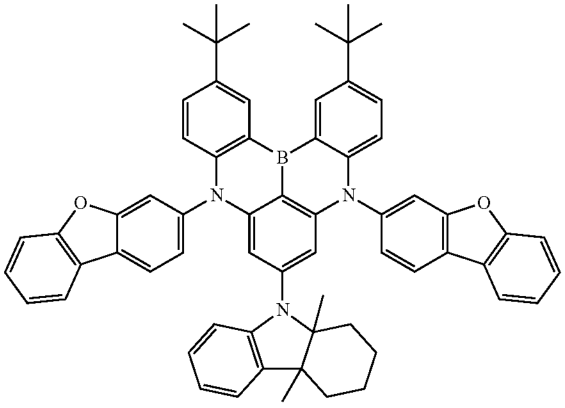
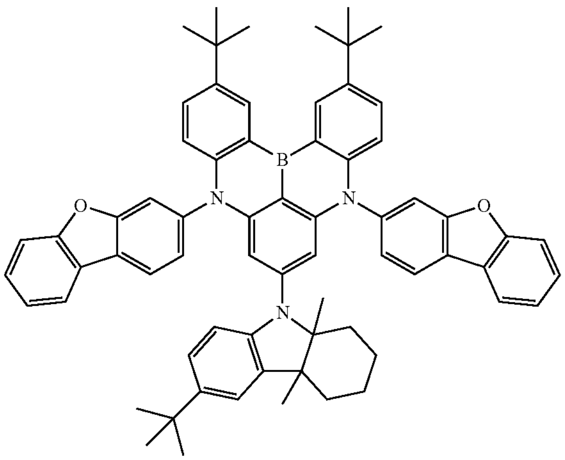
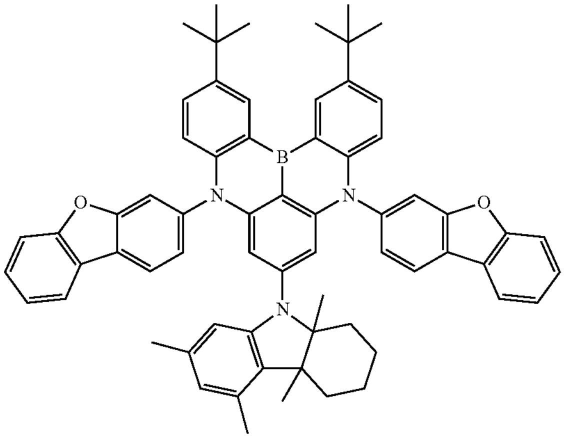

-continued
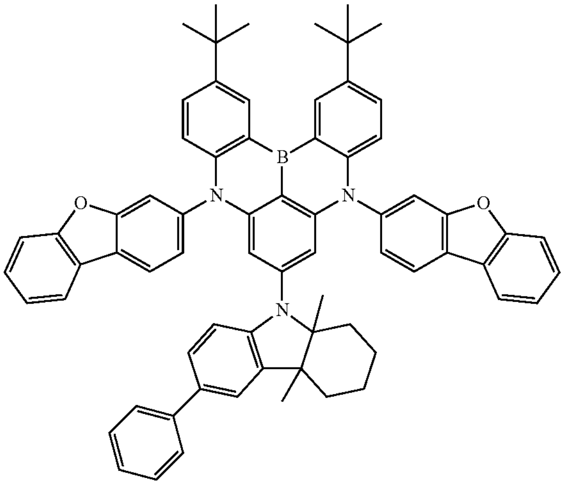
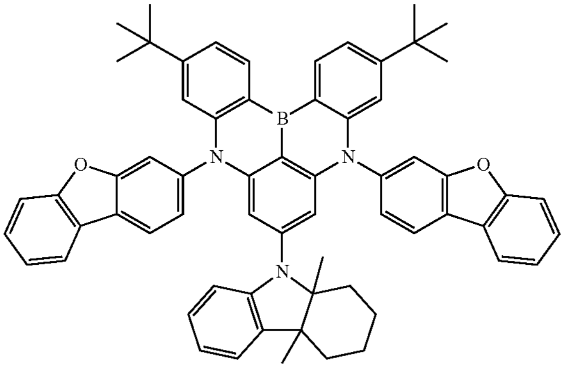
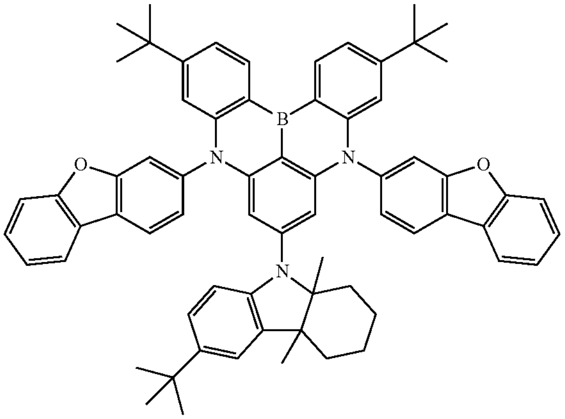
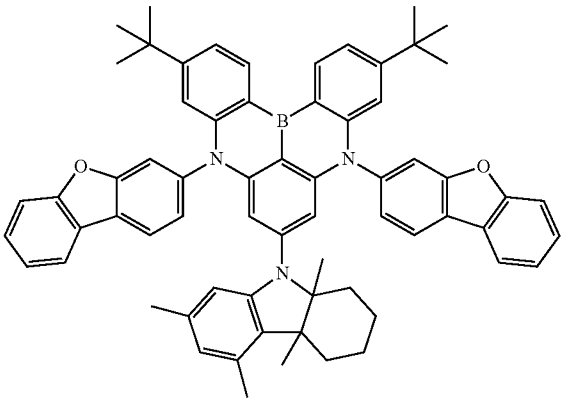
-continued
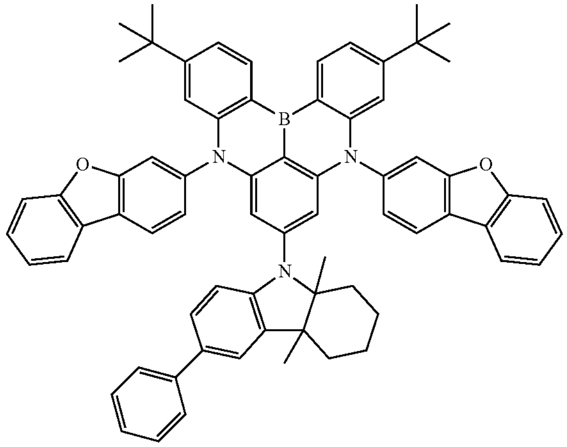
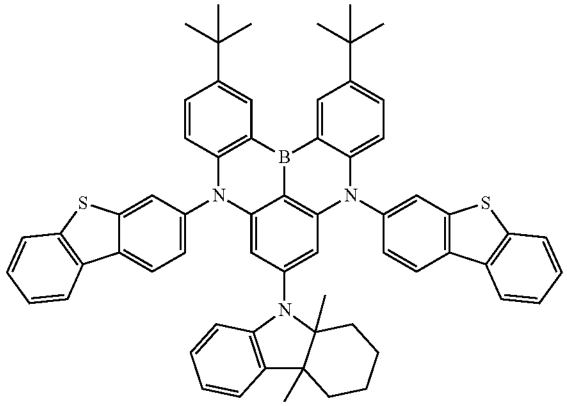
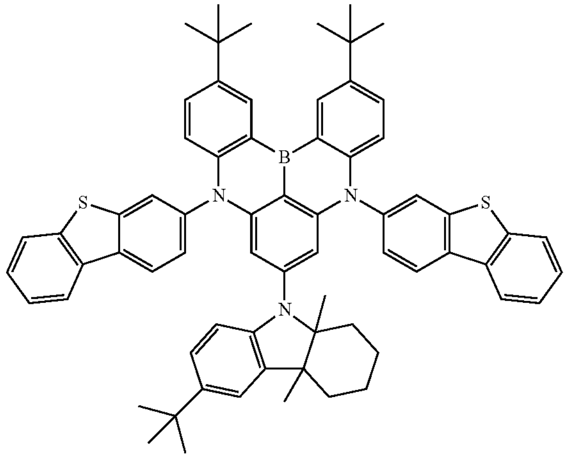

-continued
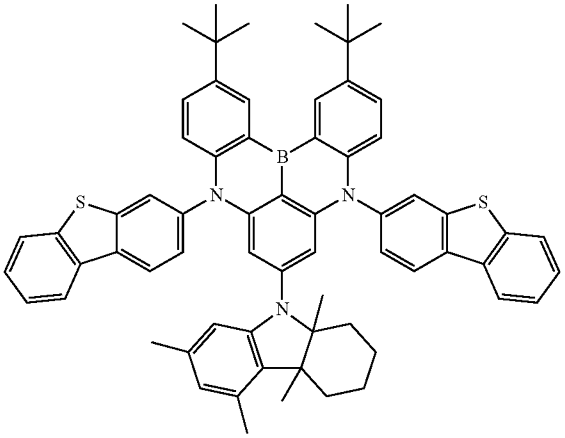
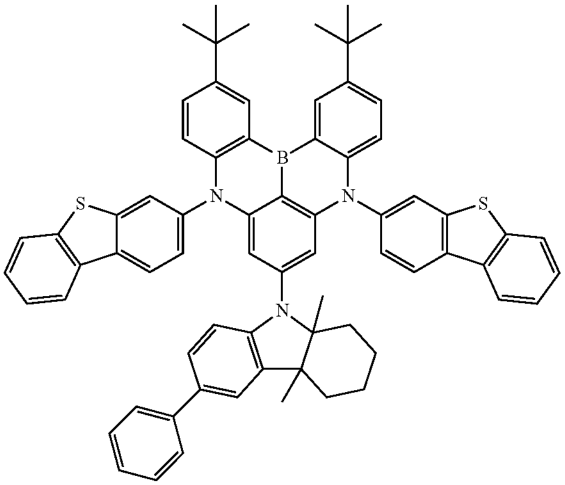
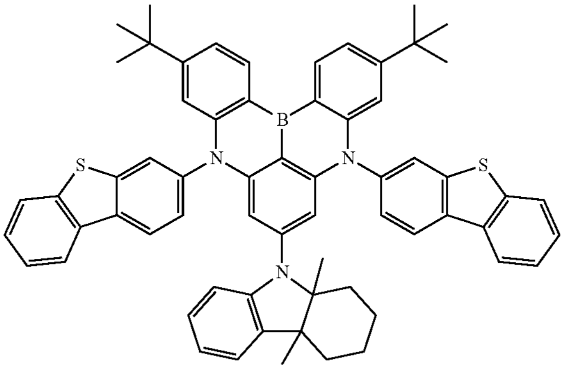
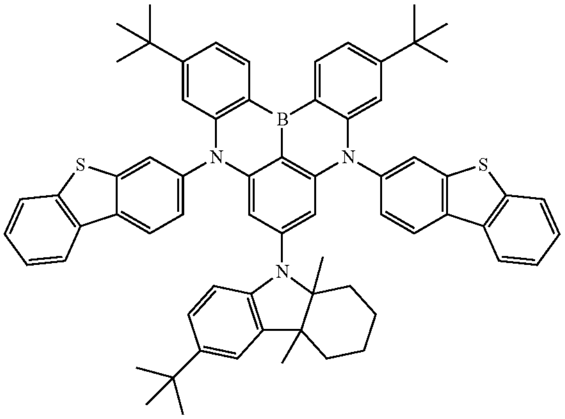
-continued
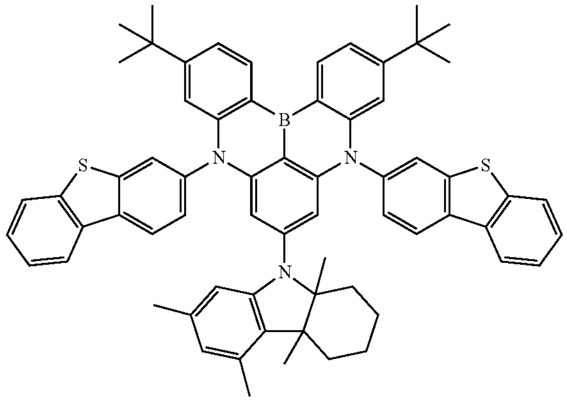
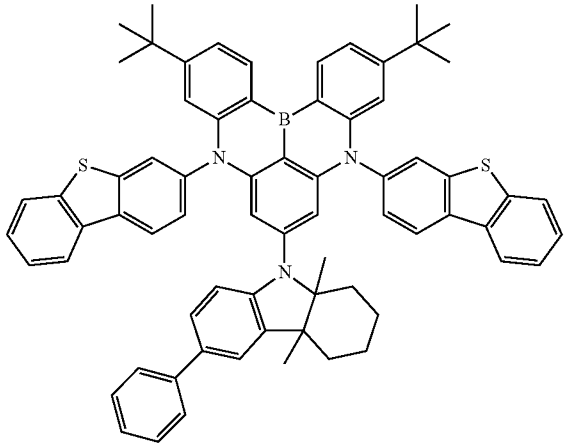
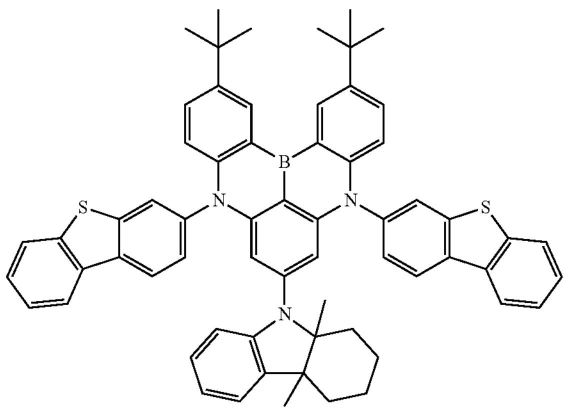
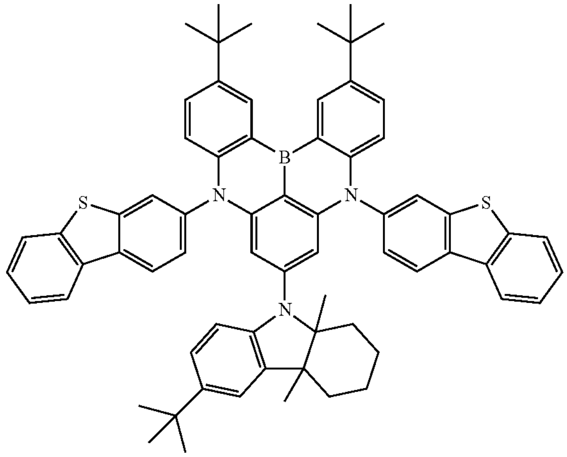

-continued
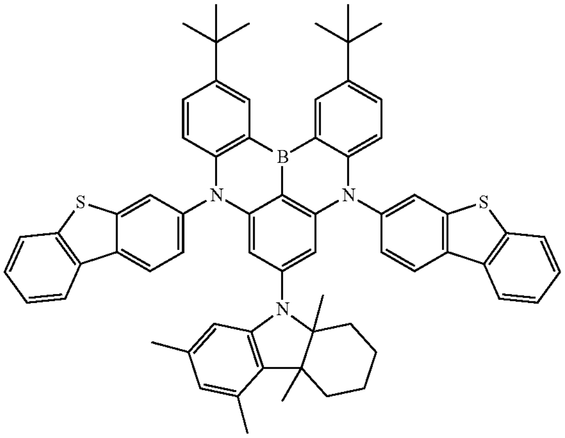
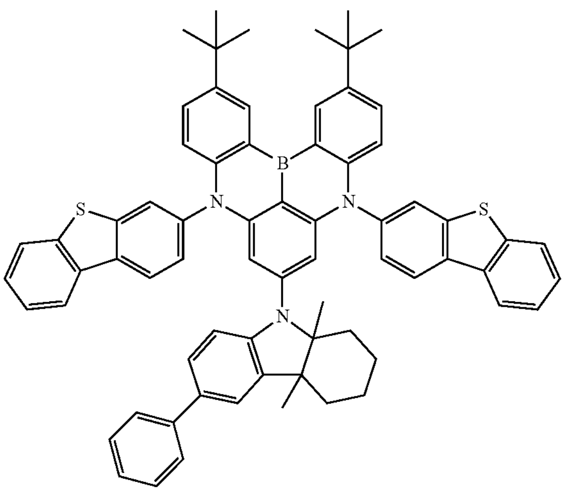
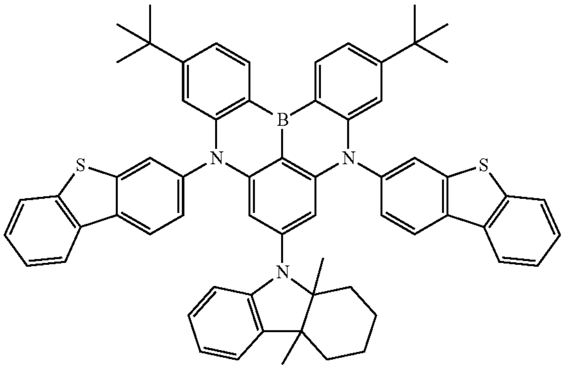
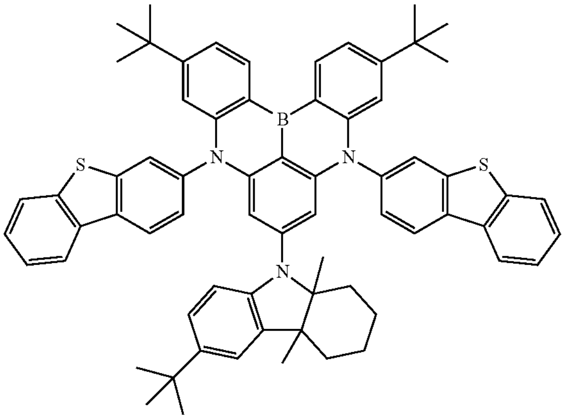
-continued
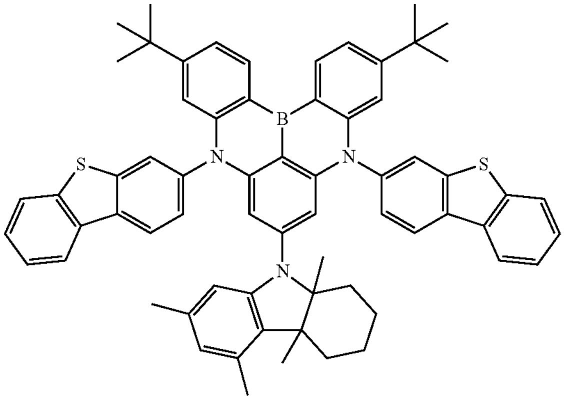
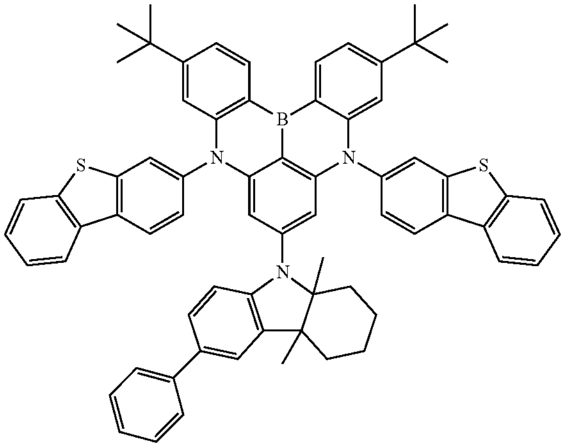
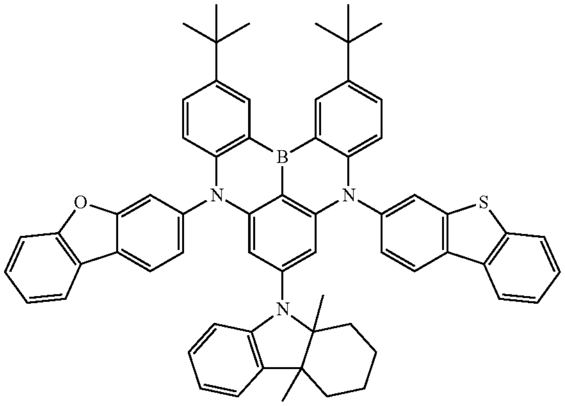
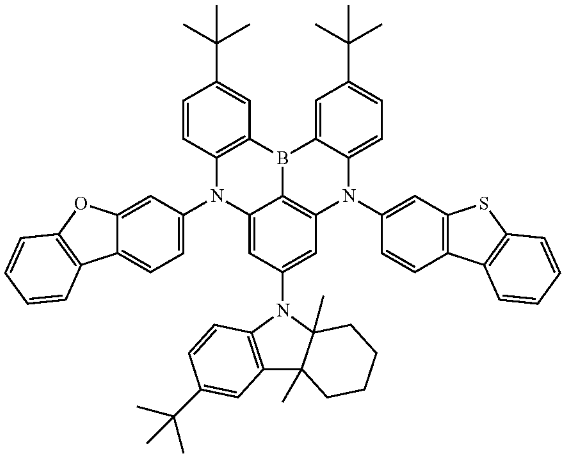

-continued
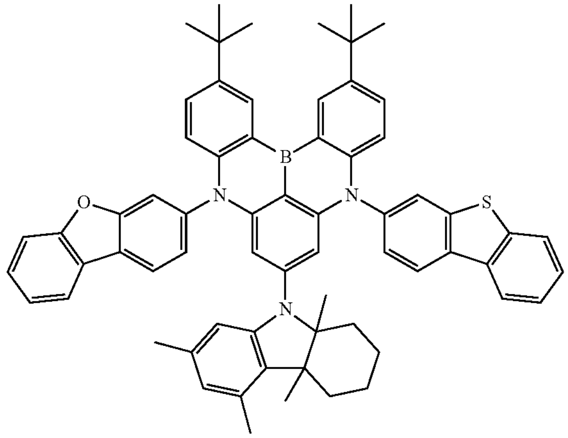
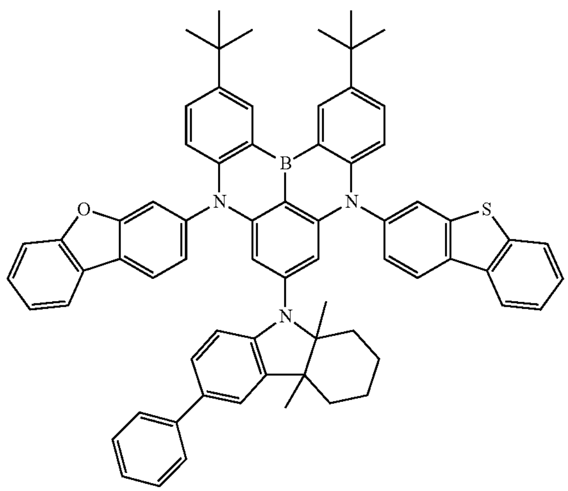
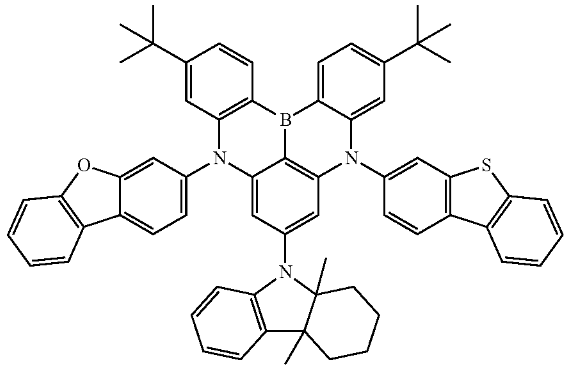
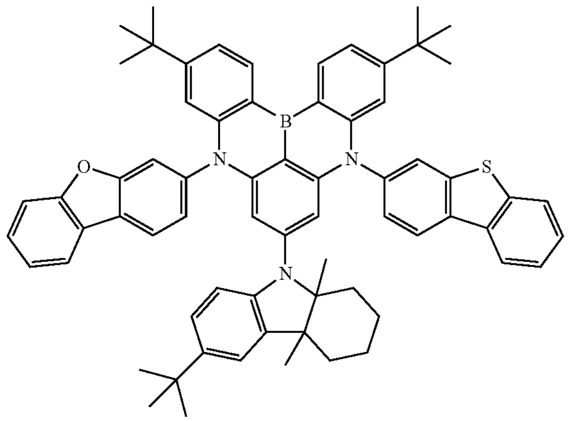
-continued
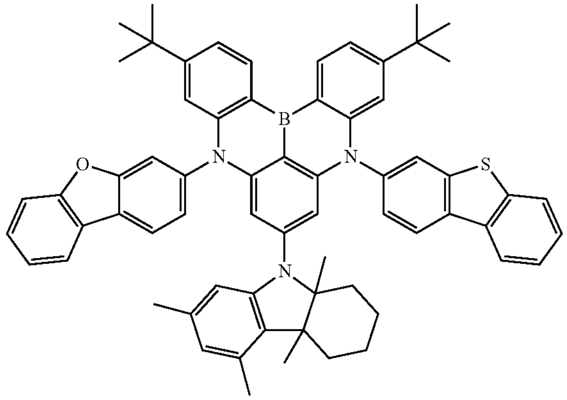
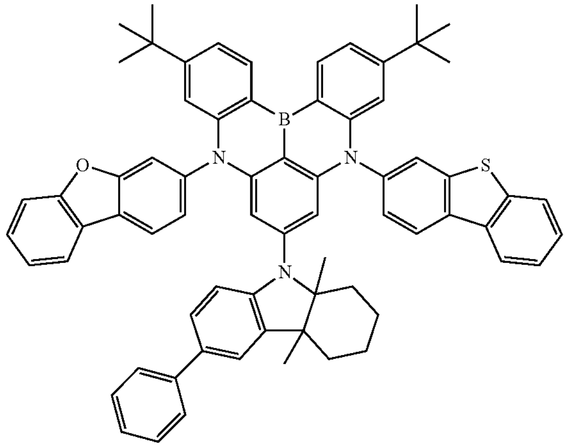
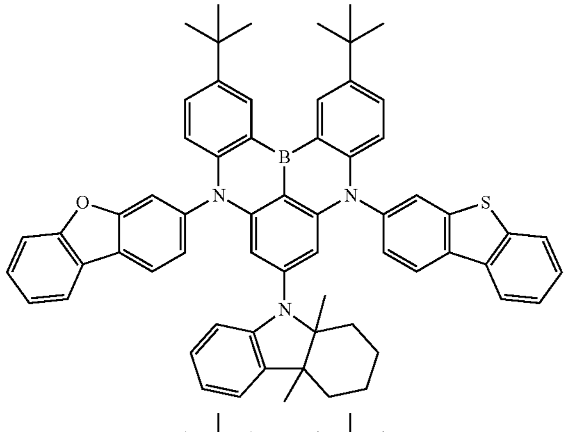
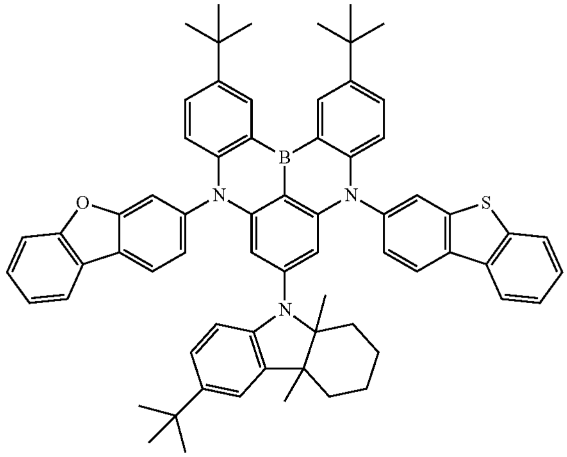

-continued
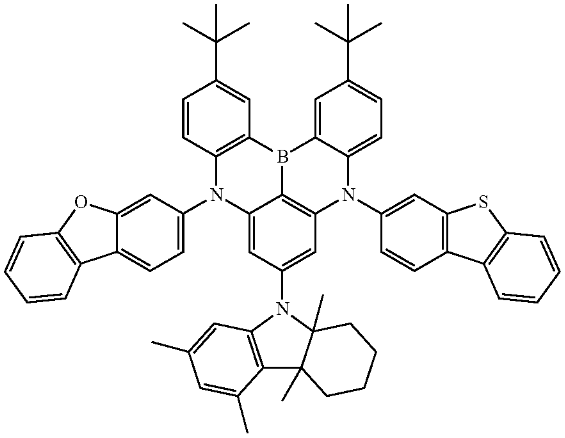
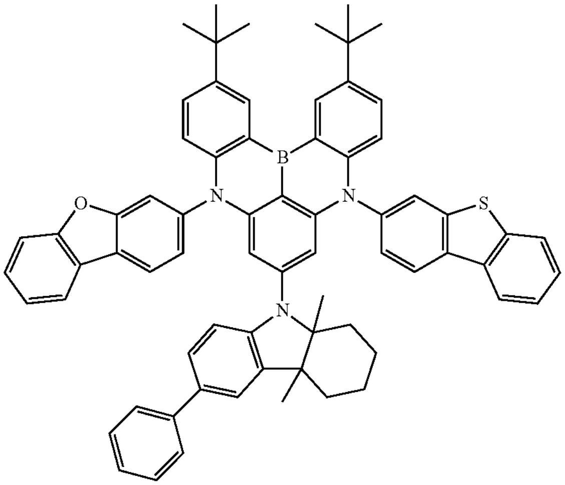
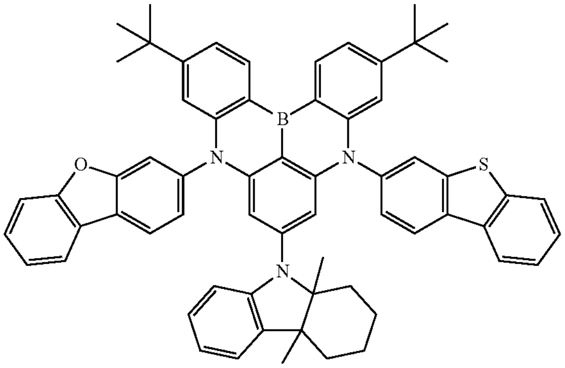
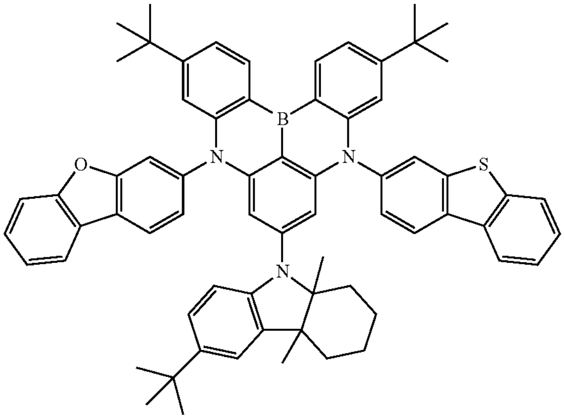
-continued
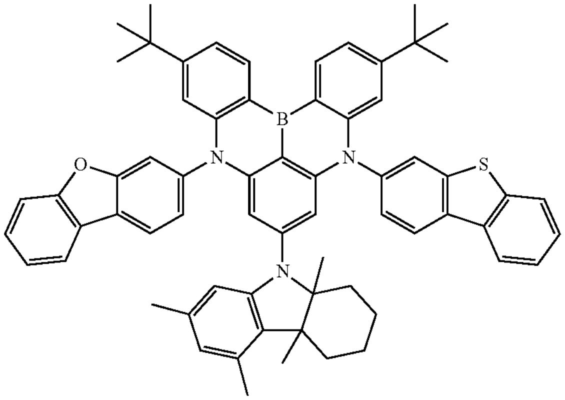
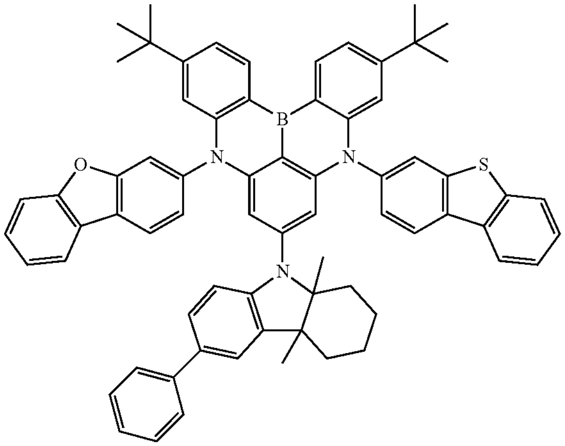
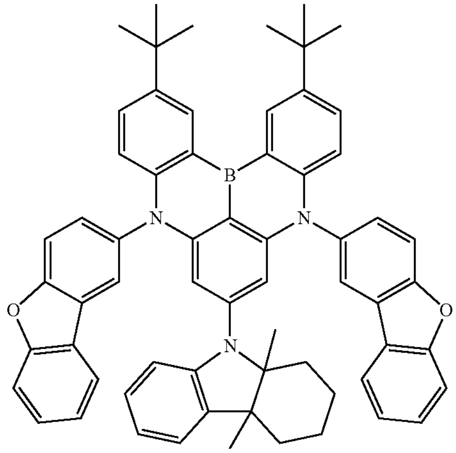

-continued
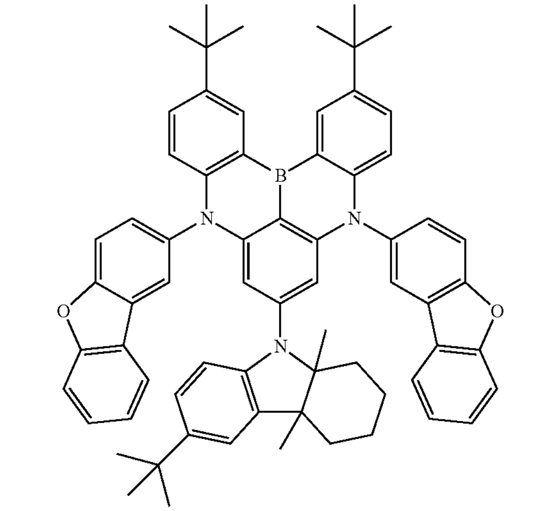
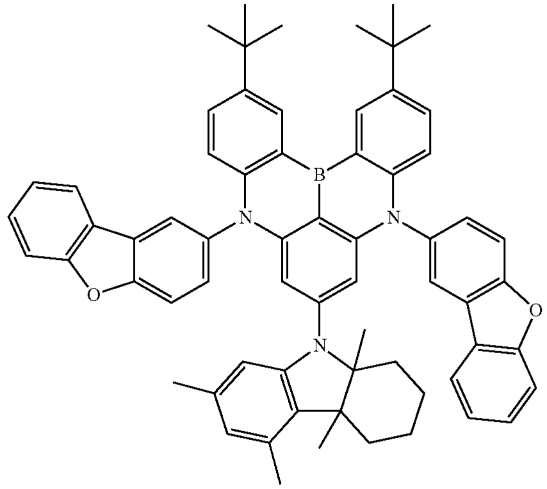
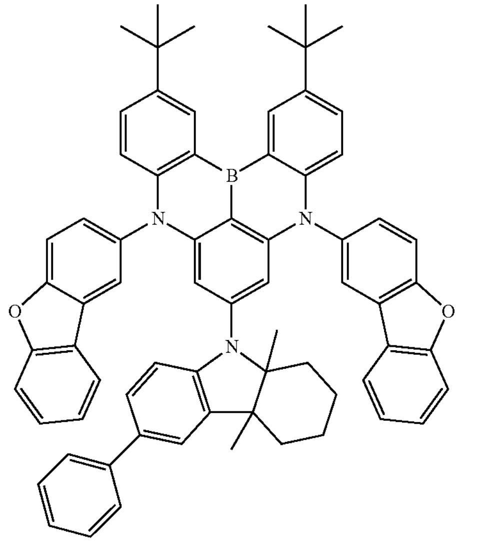
-continued
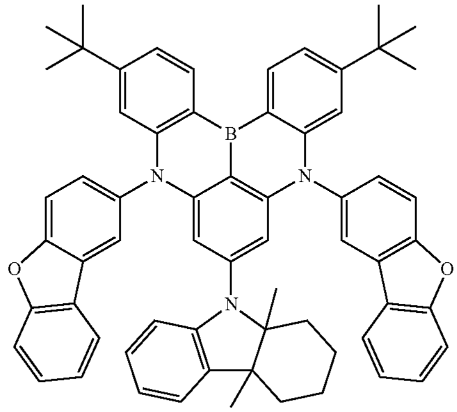
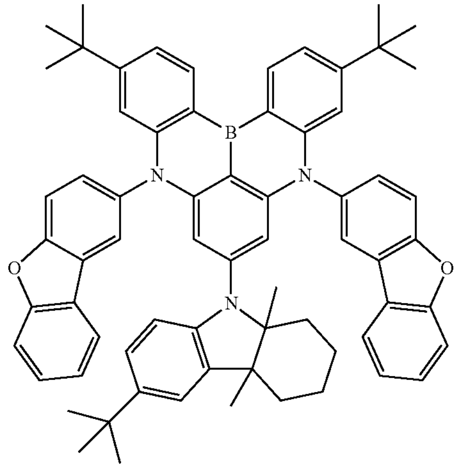
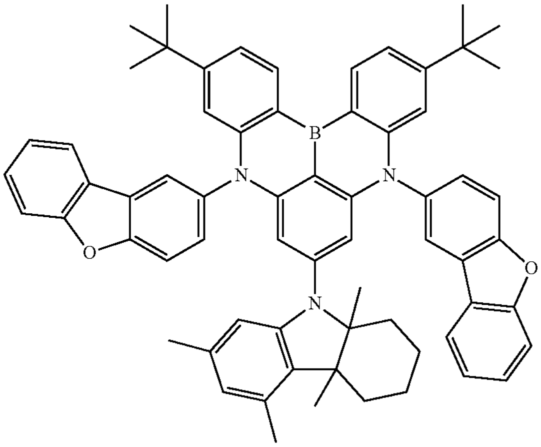

-continued
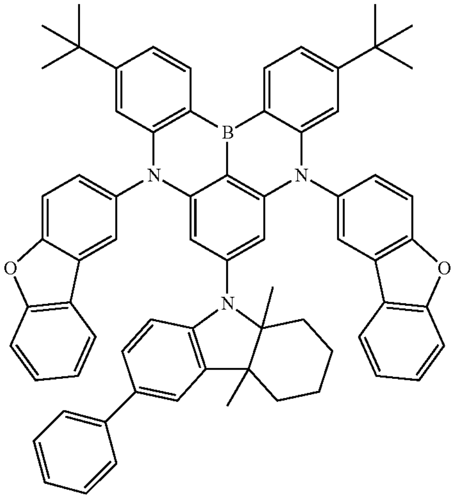
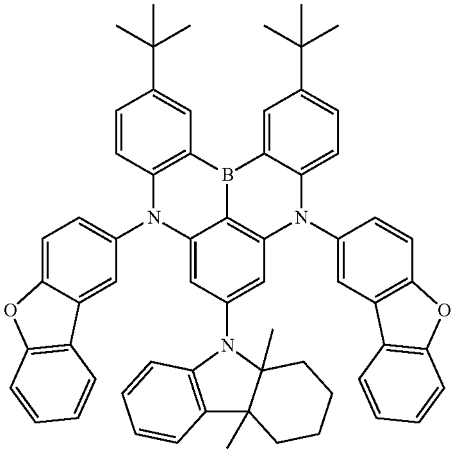
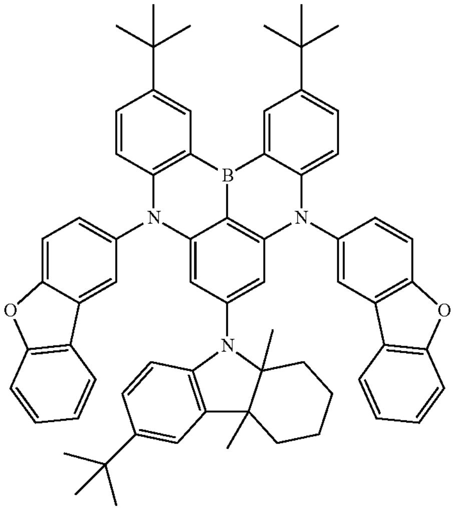
-continued
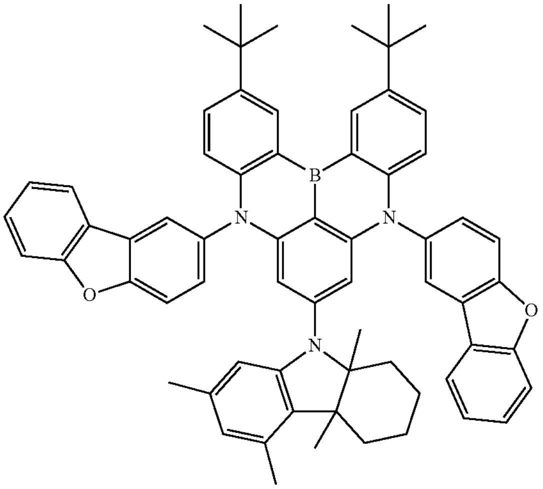
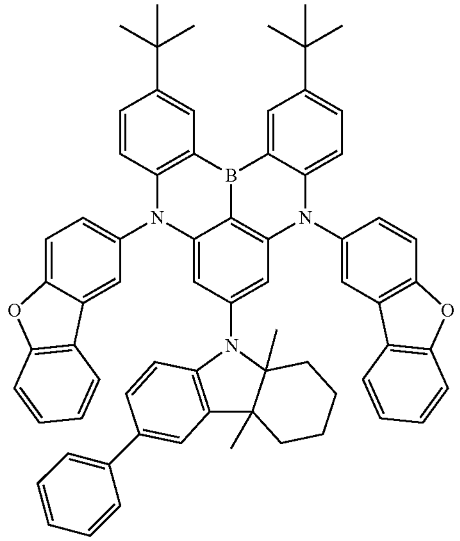
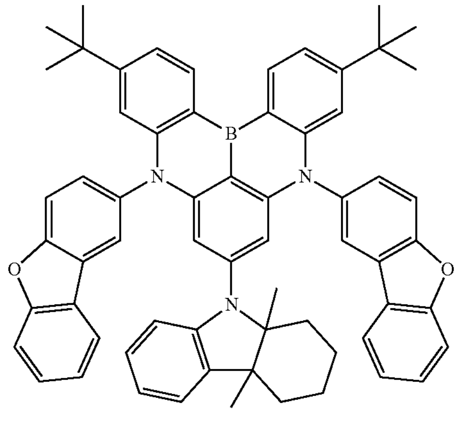

-continued
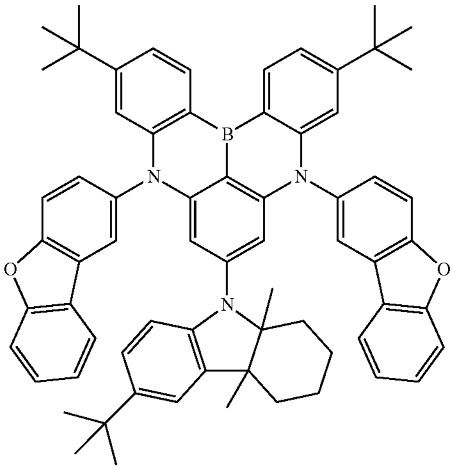
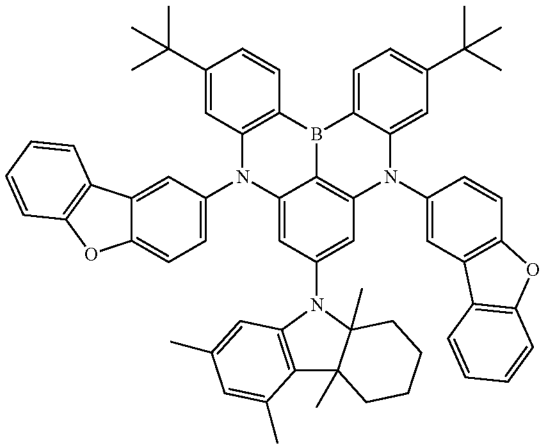
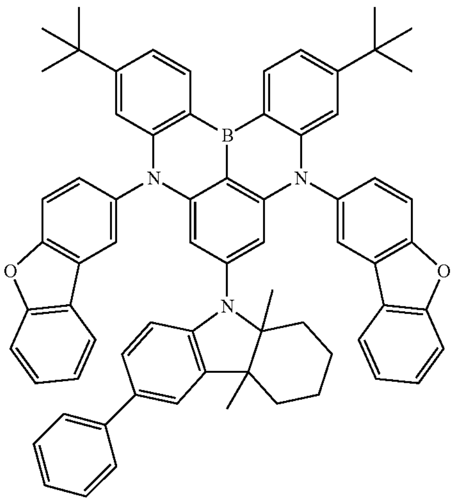
-continued
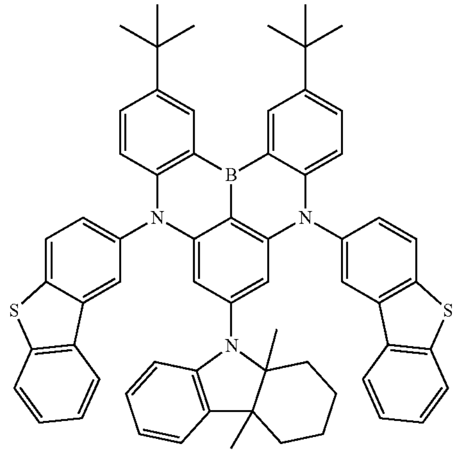
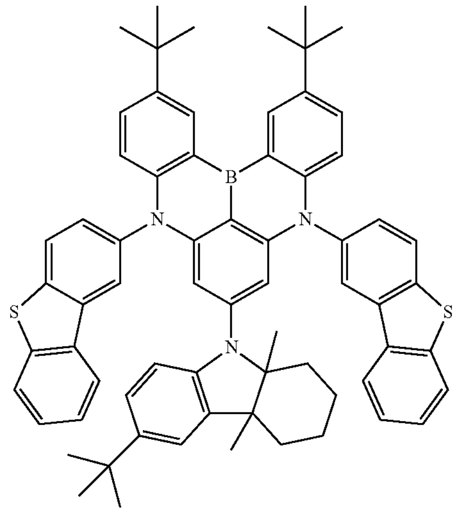
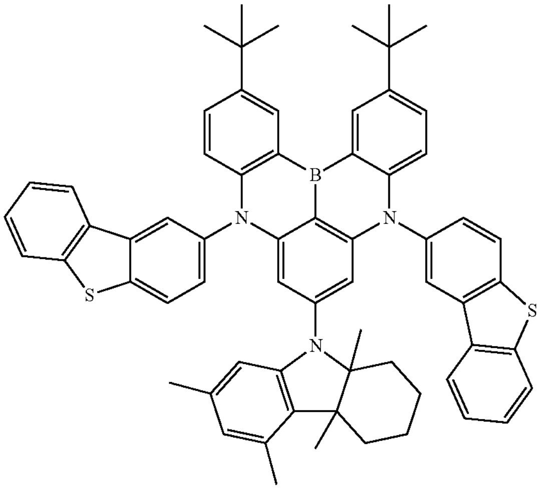

-continued
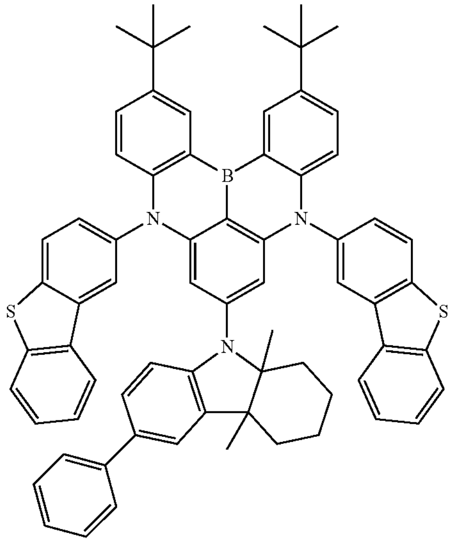
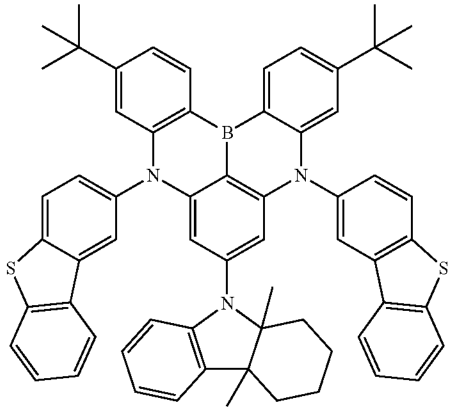
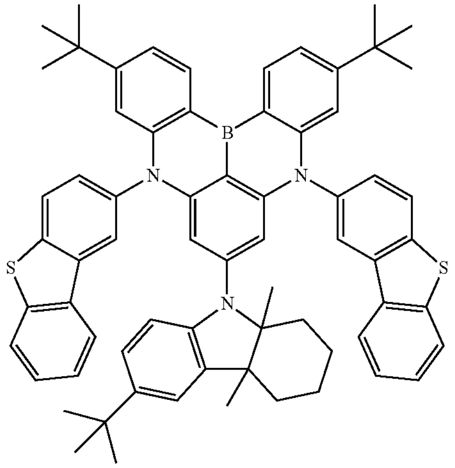
-continued
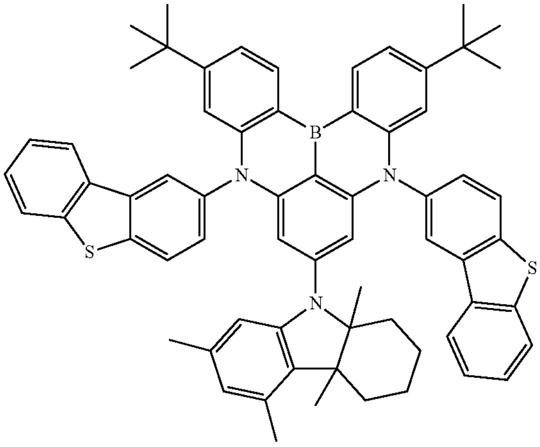
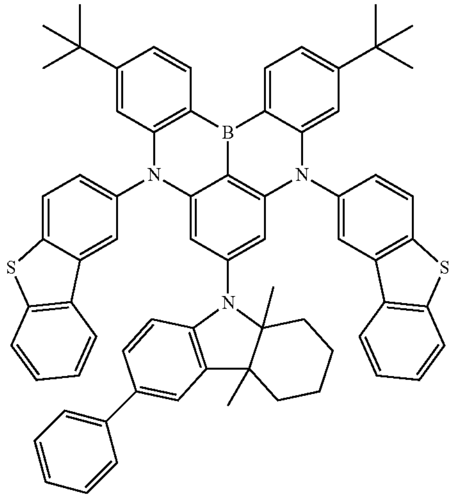
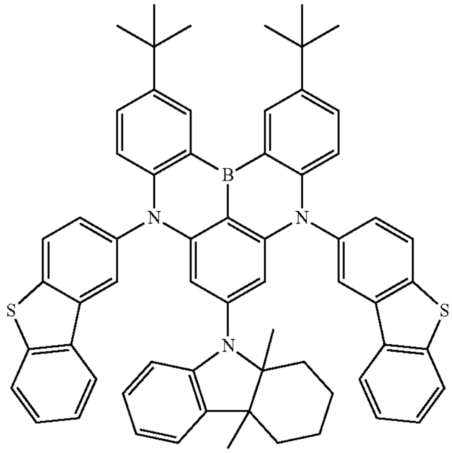

-continued
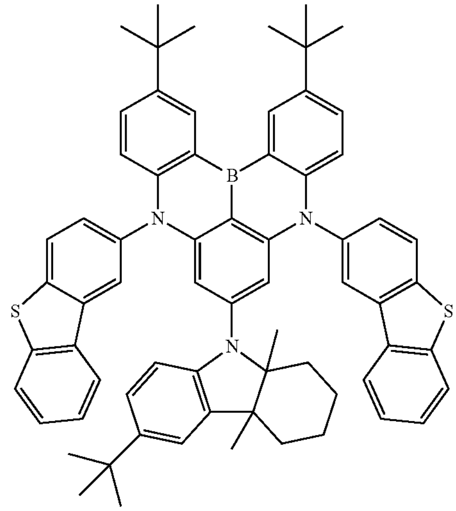
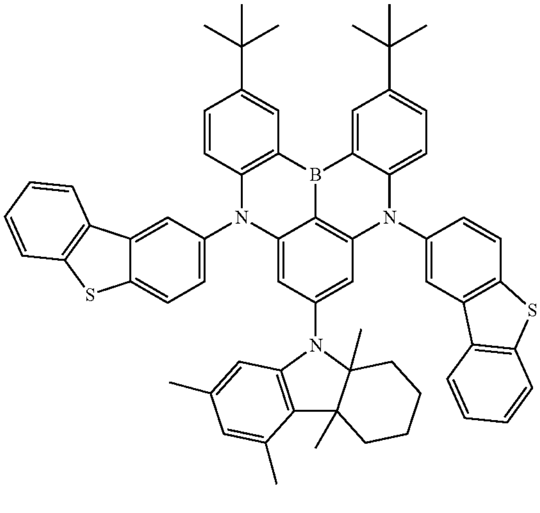
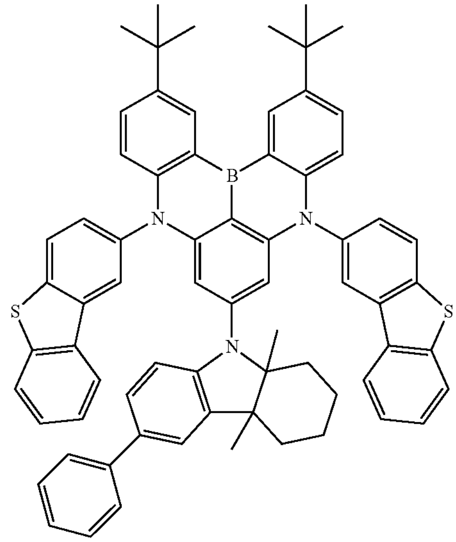
-continued
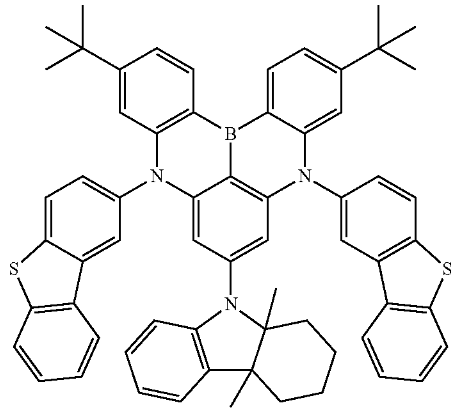
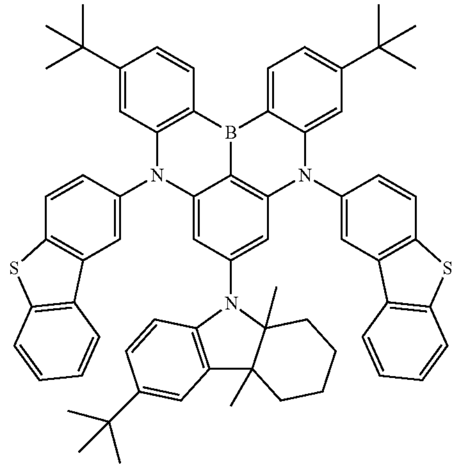
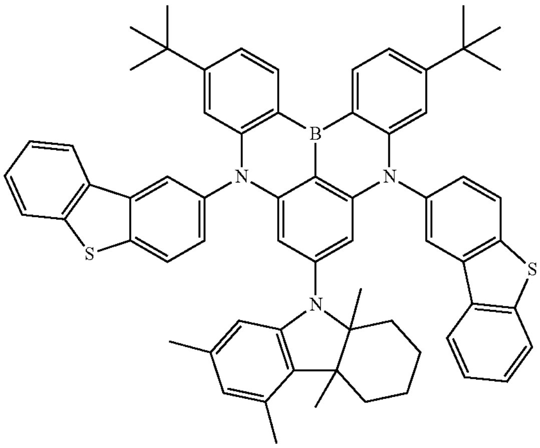

-continued
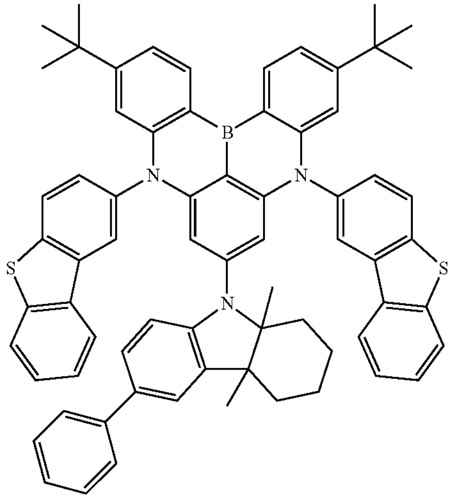
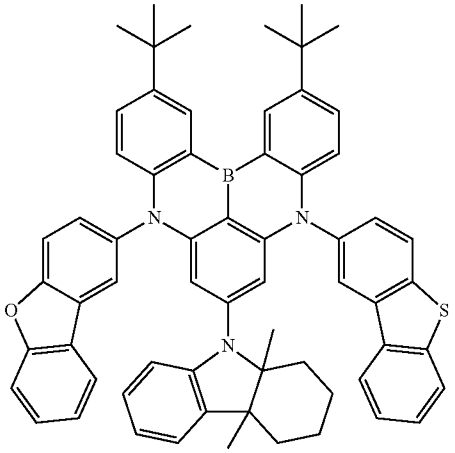
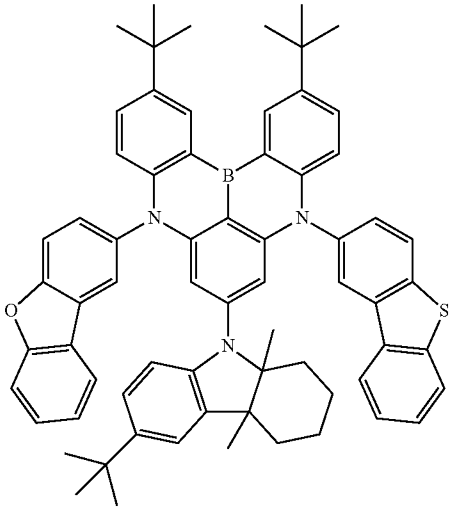
-continued
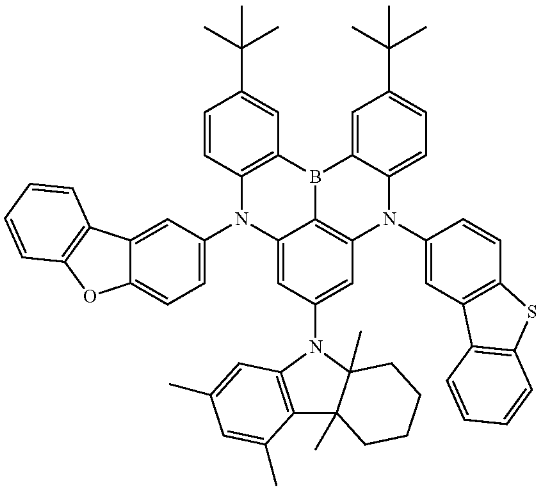
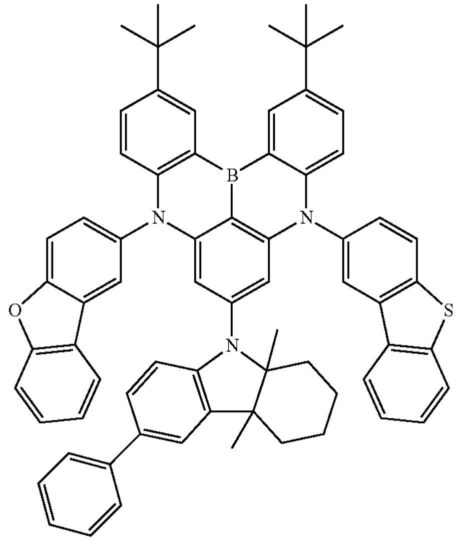
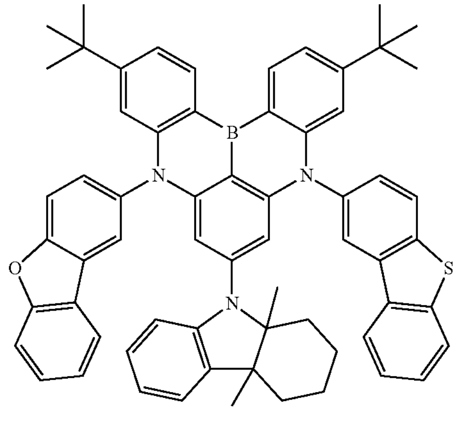

-continued
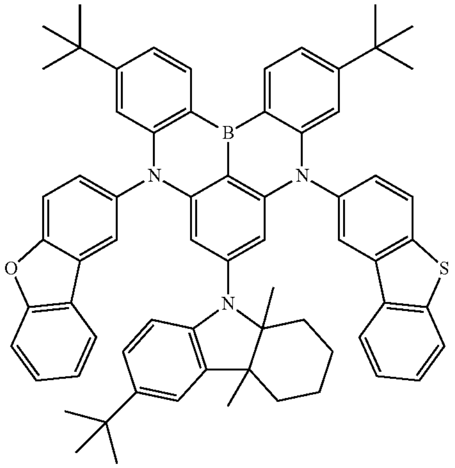
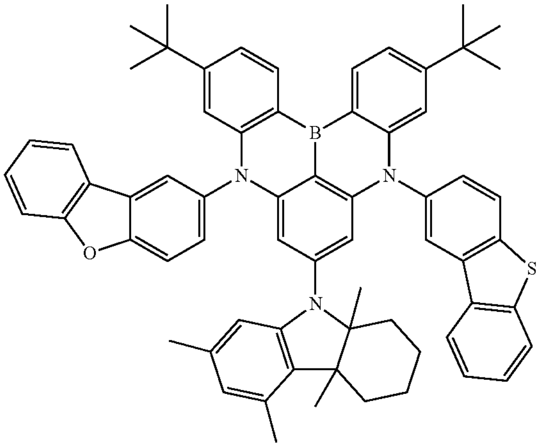
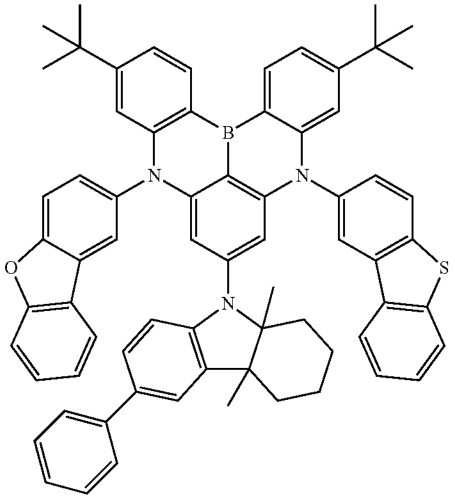
-continued
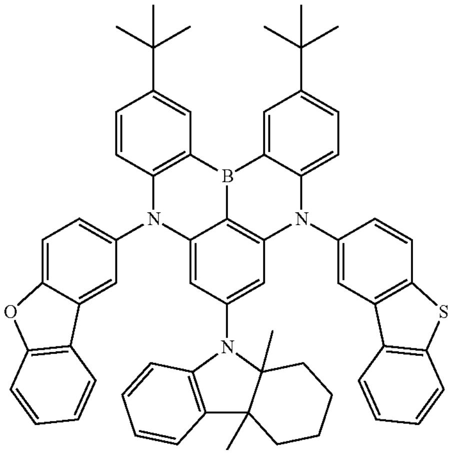
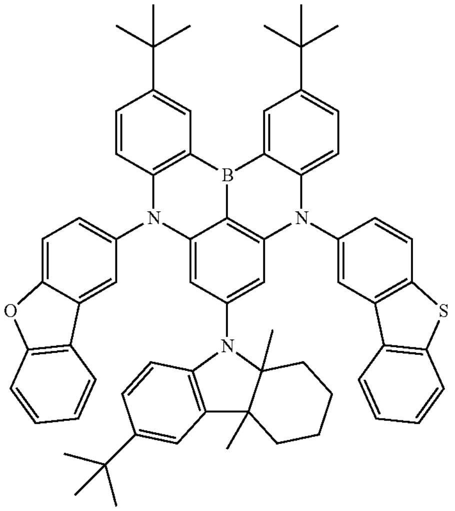
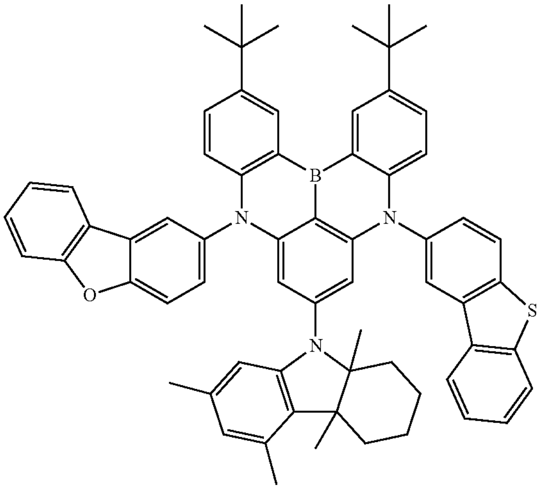

-continued
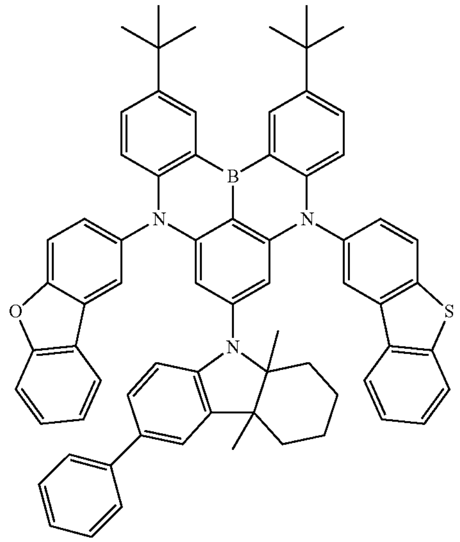
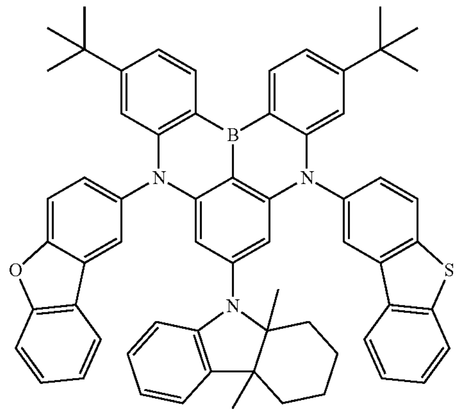
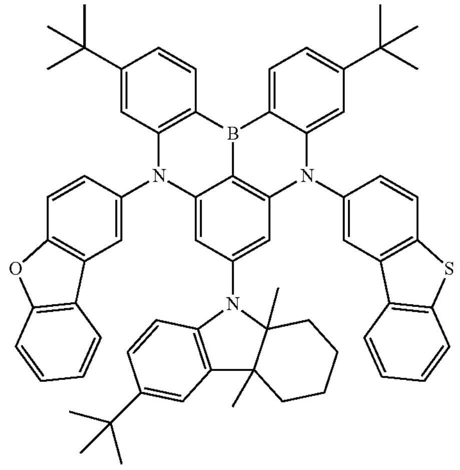
-continued
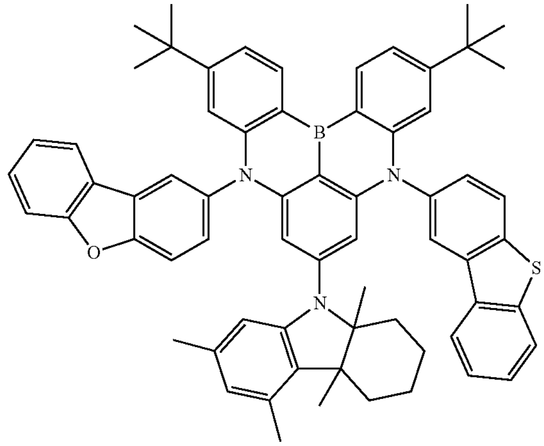
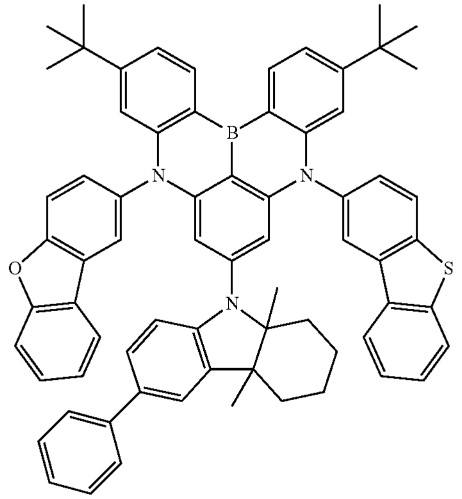
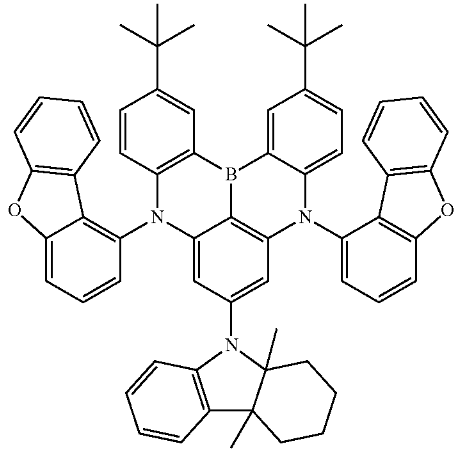

-continued
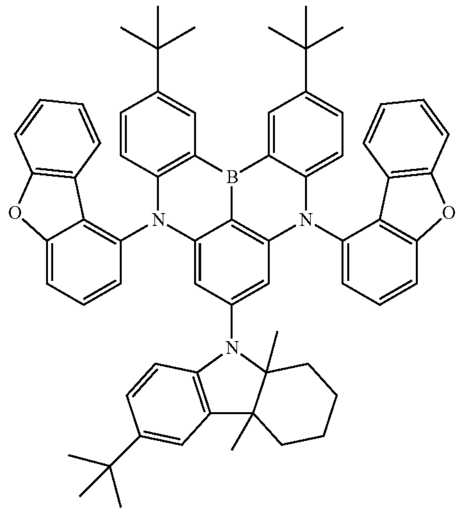
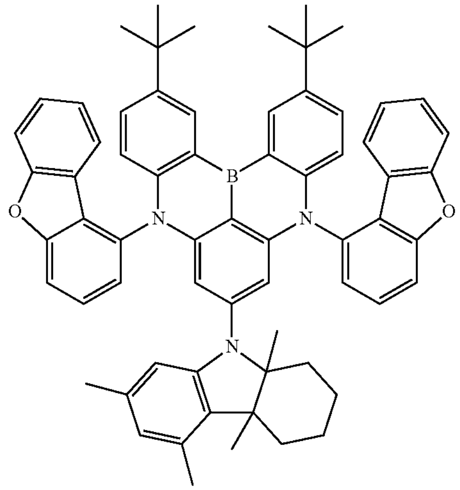
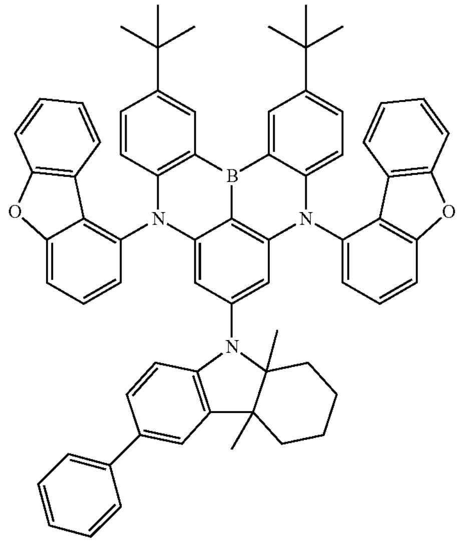
-continued
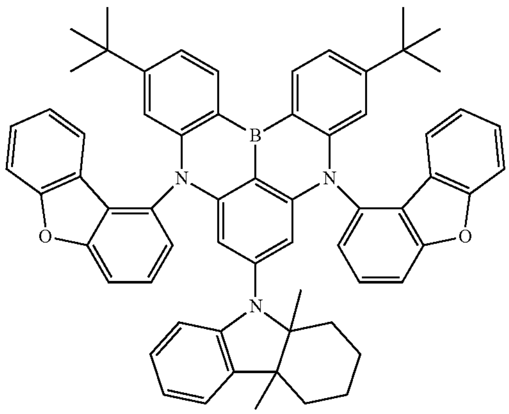
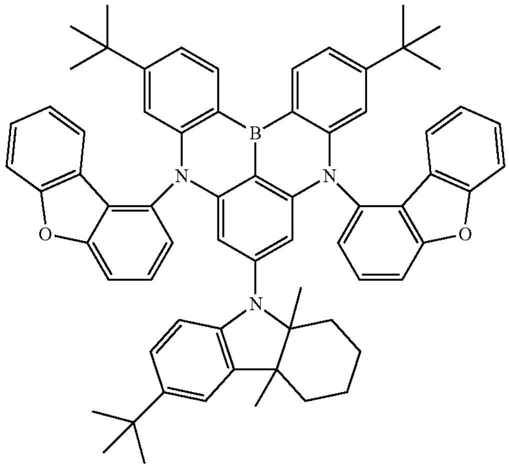
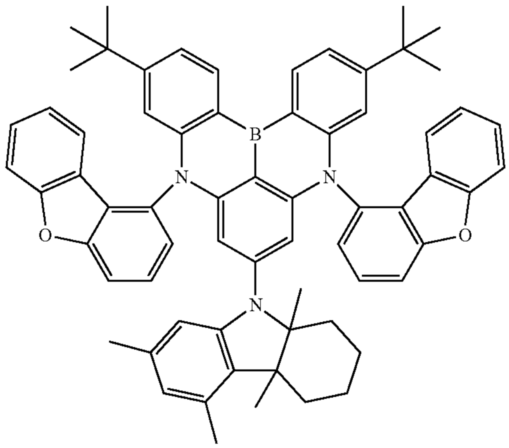

-continued
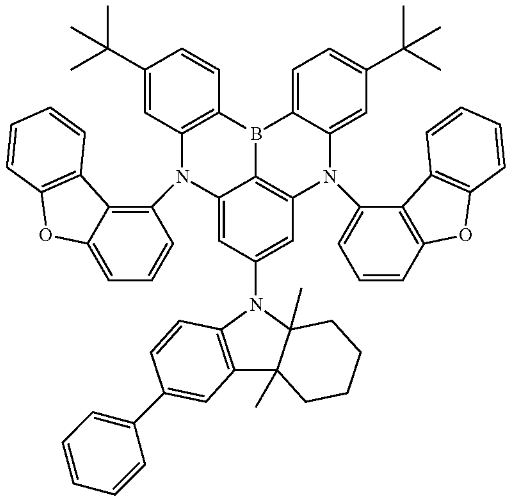
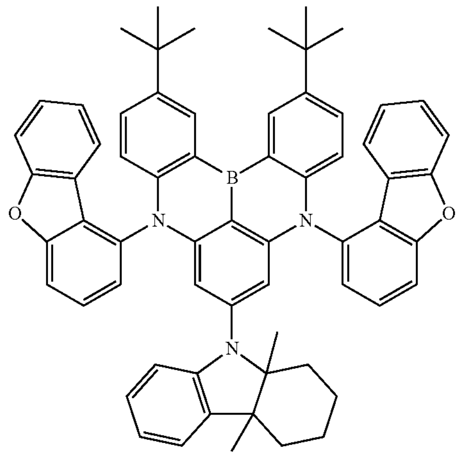
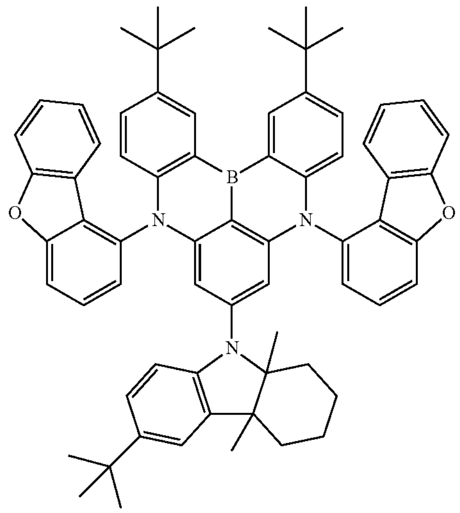
-continued
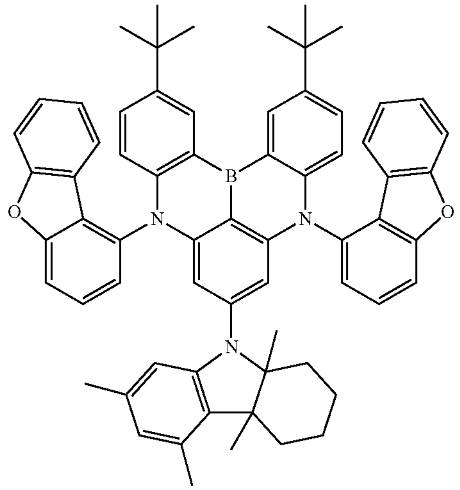
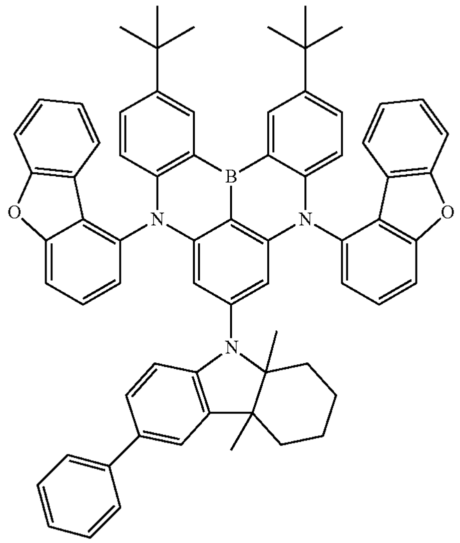
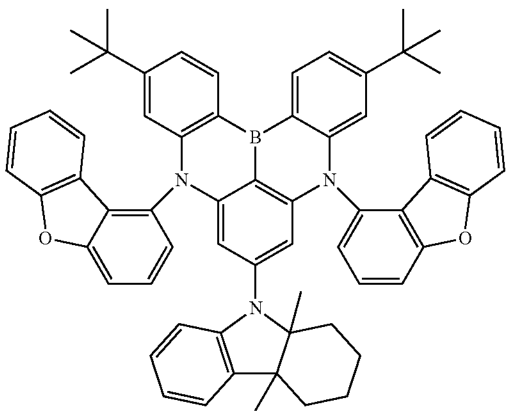

-continued
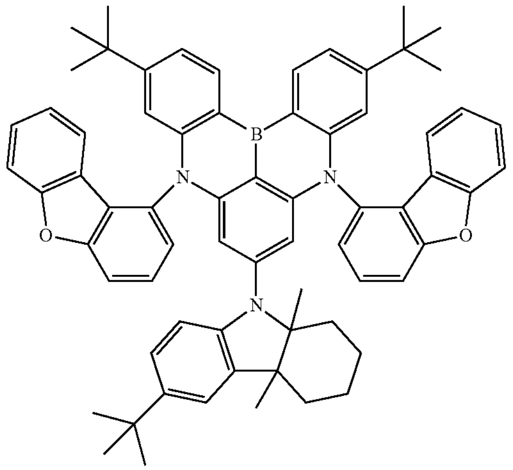
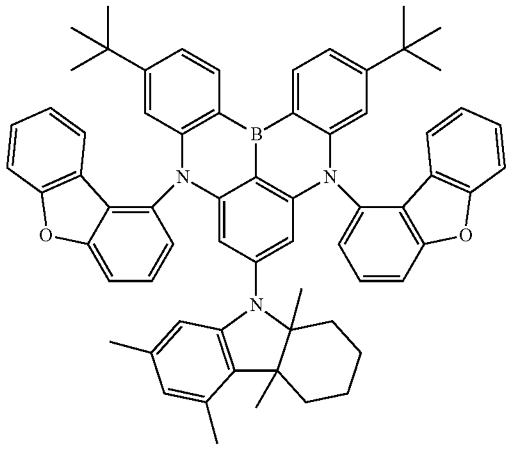
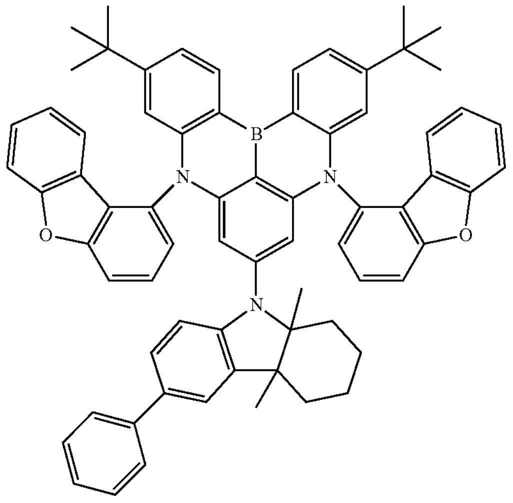
-continued
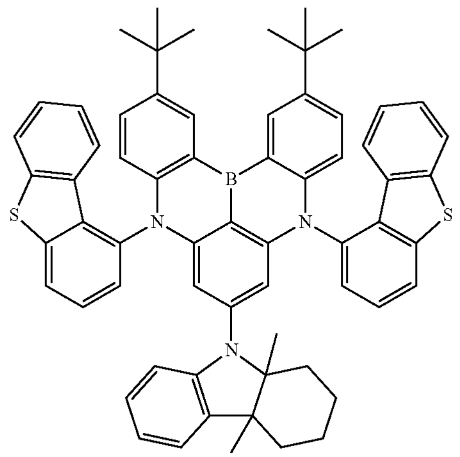
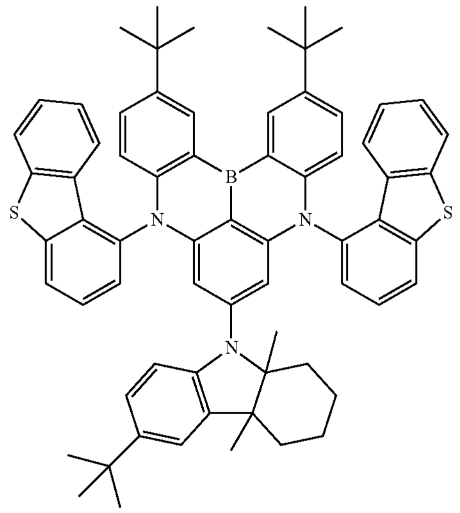
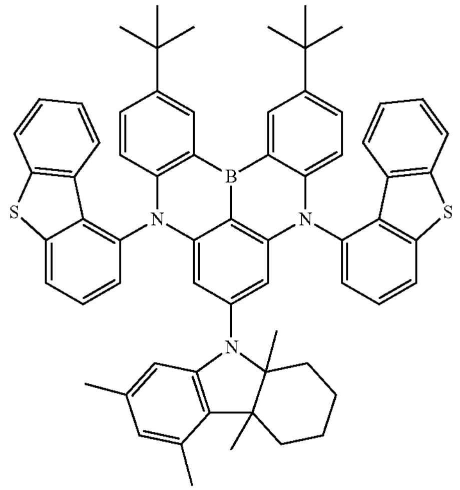

-continued
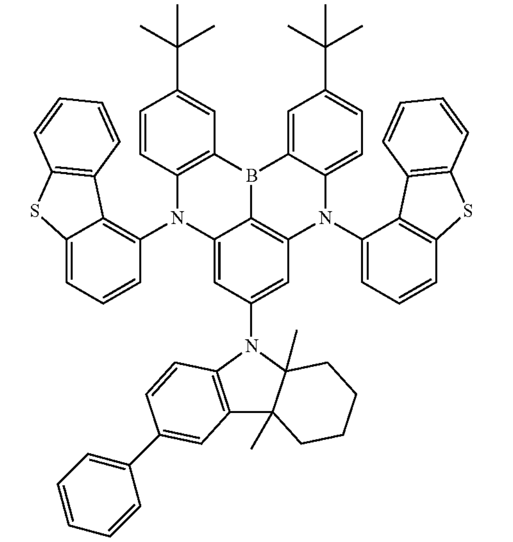
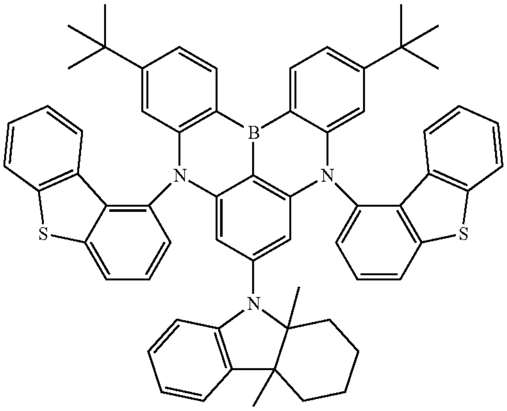
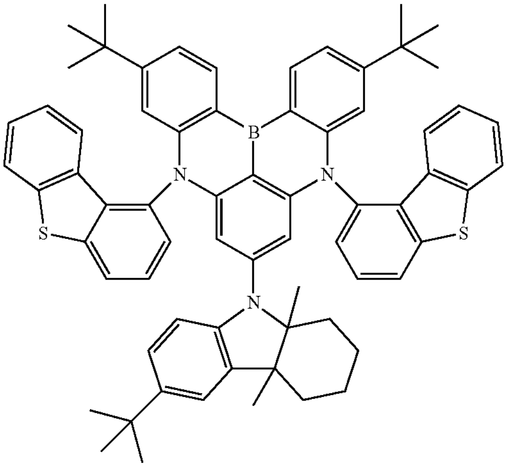
-continued
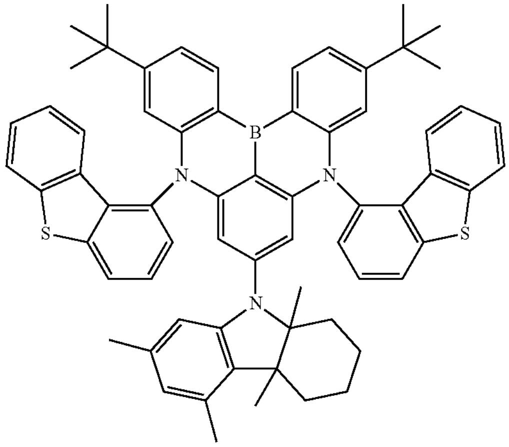
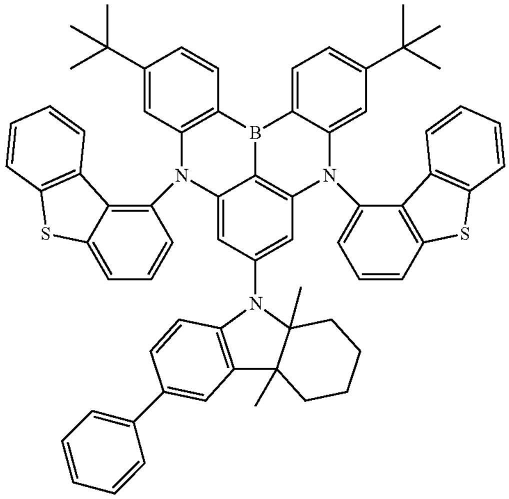
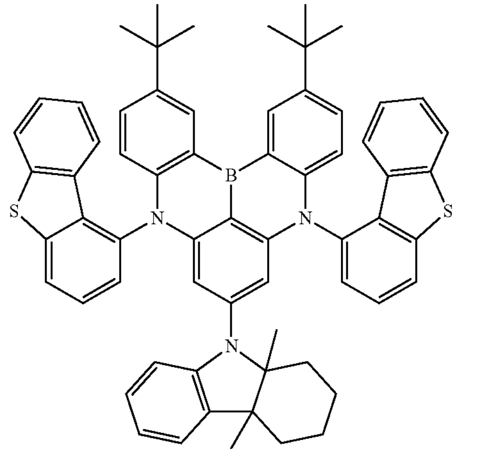

-continued
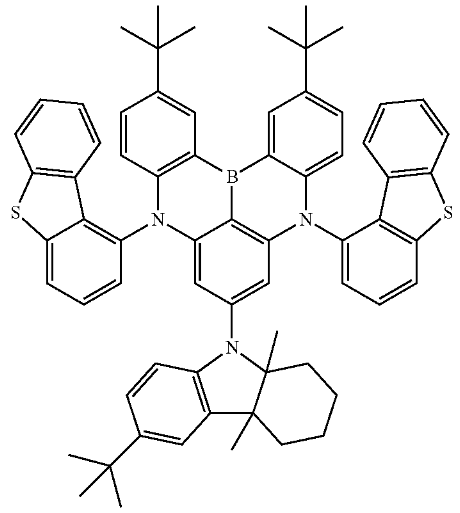
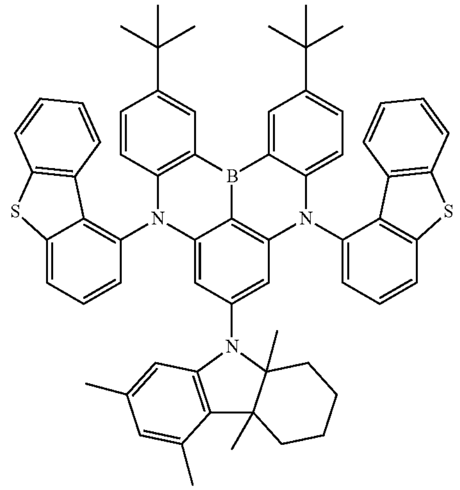
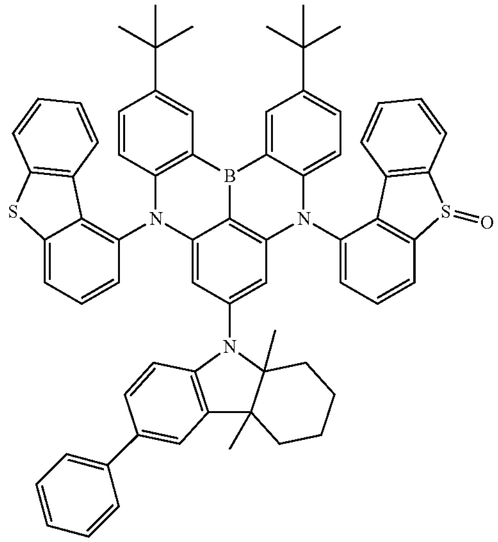
-continued
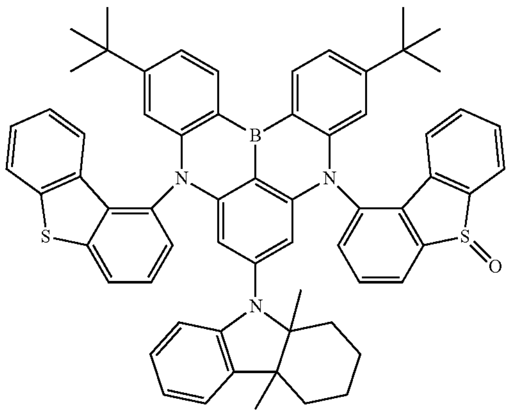
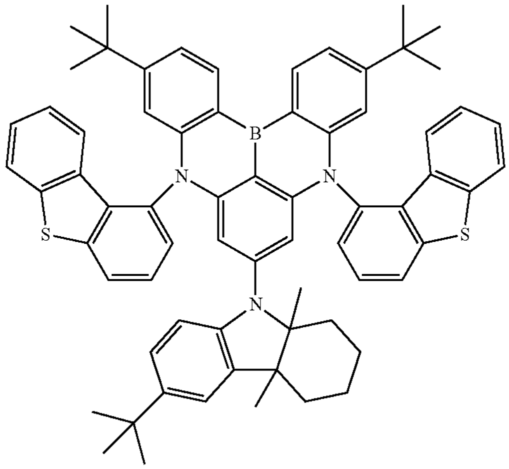
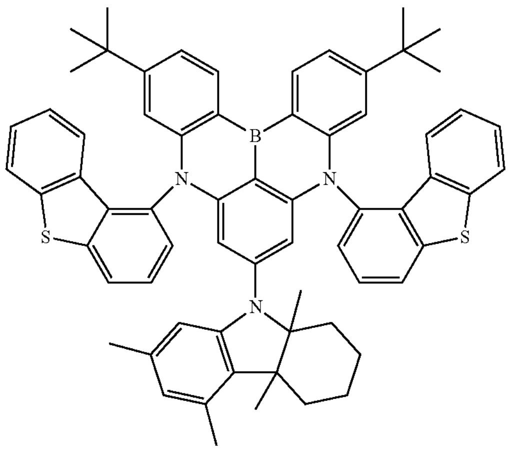

-continued
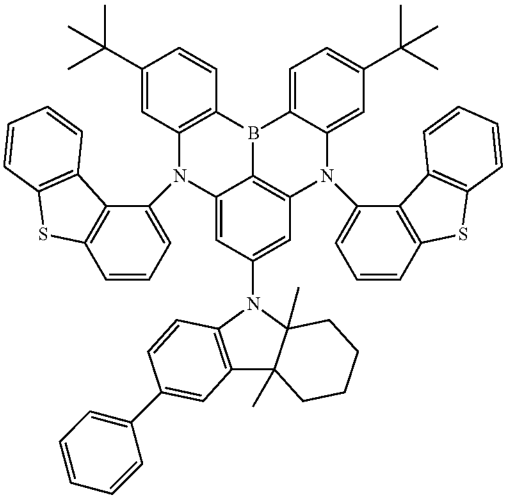
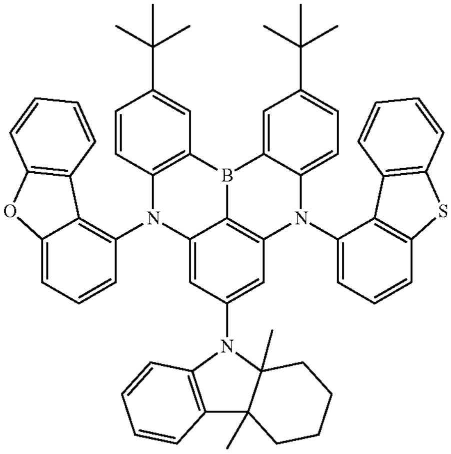
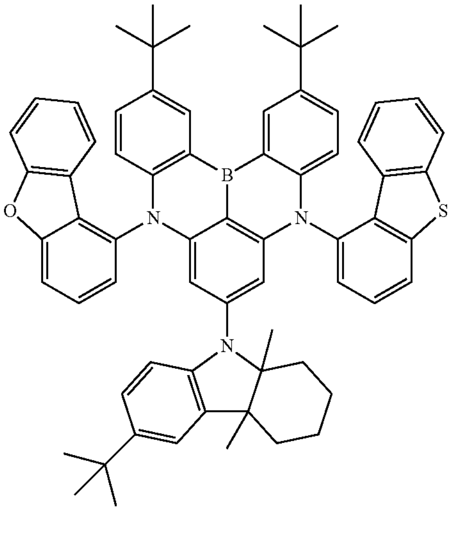
-continued
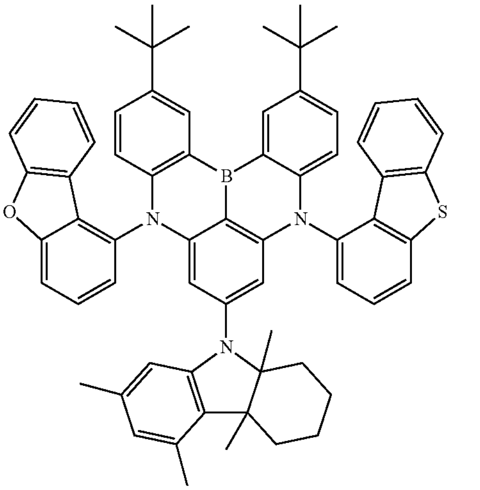
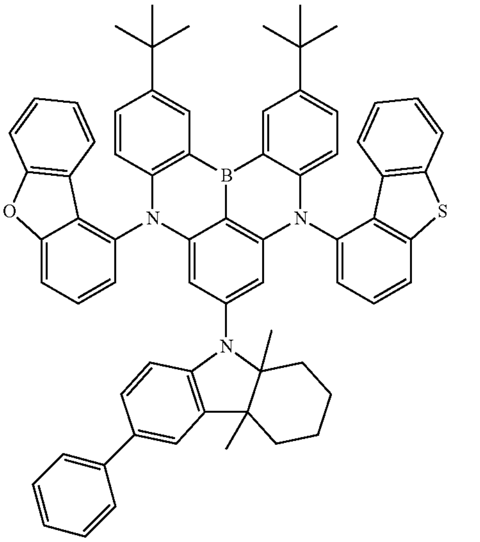
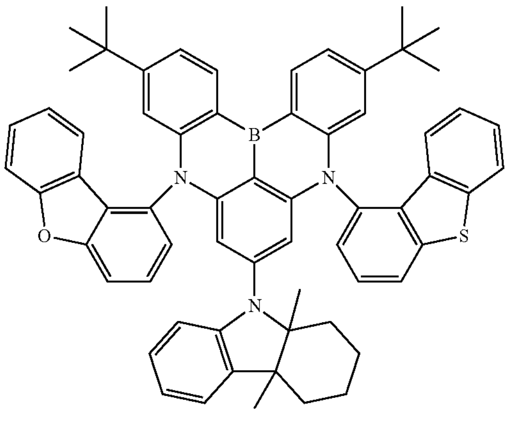

-continued
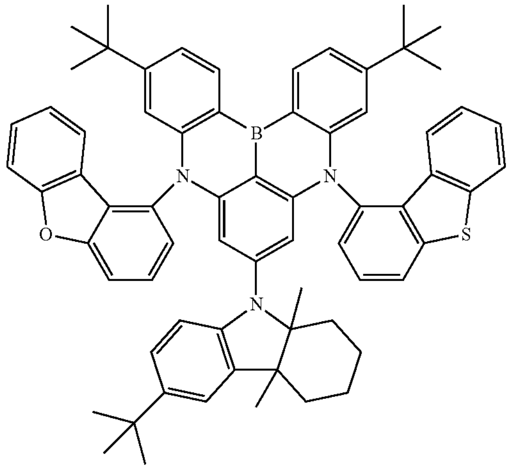
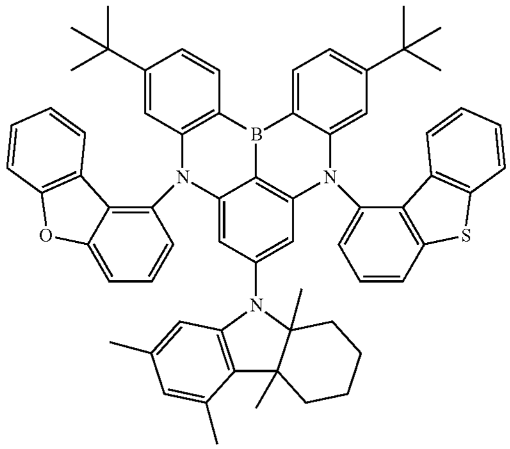
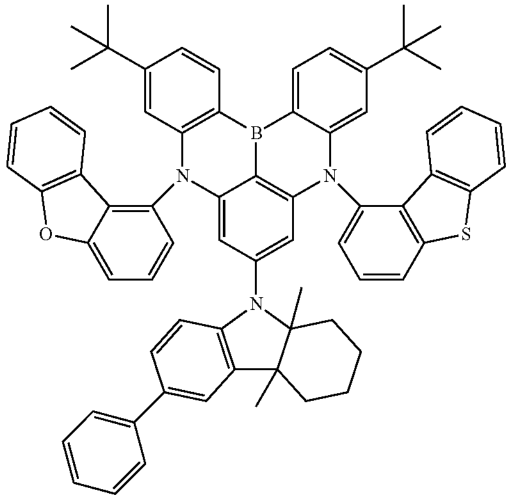
-continued
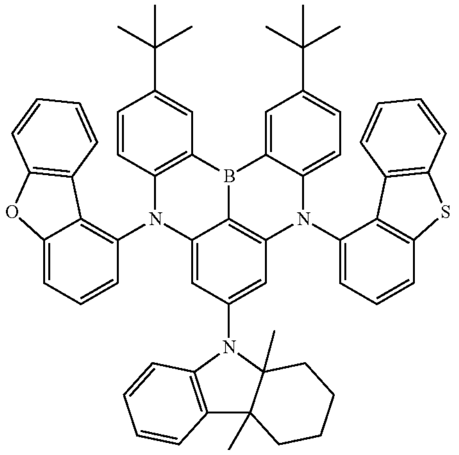
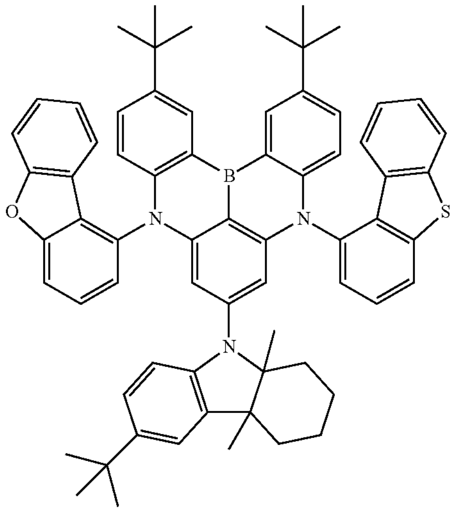
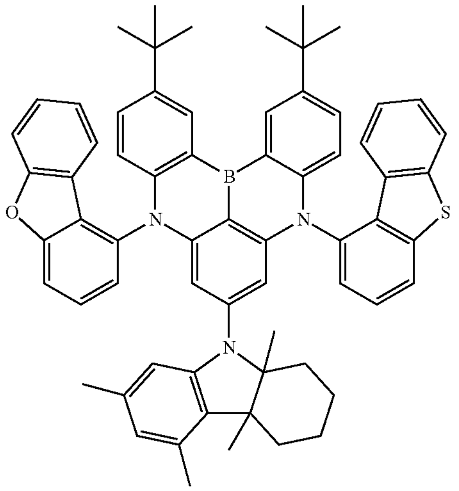

-continued
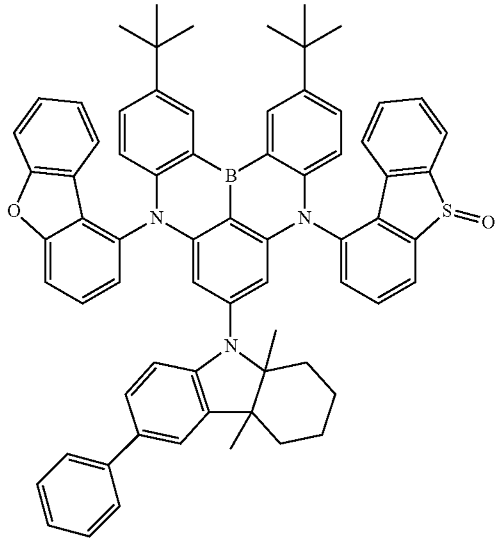
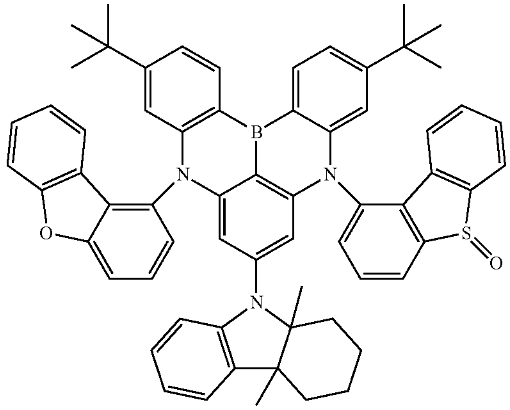
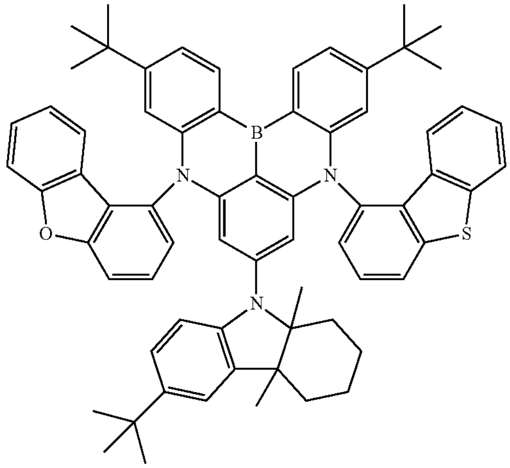
-continued
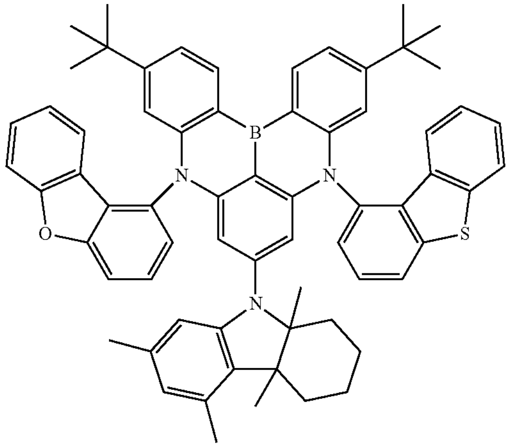
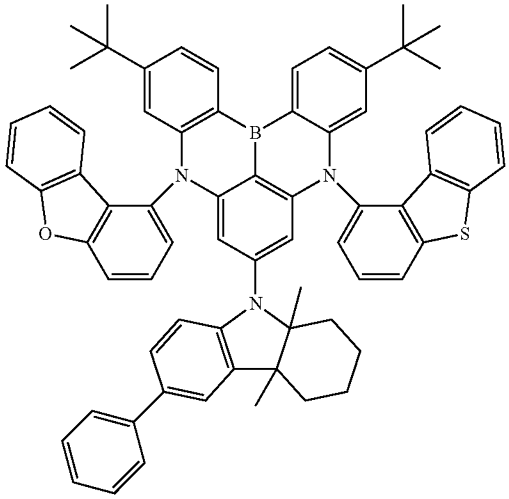
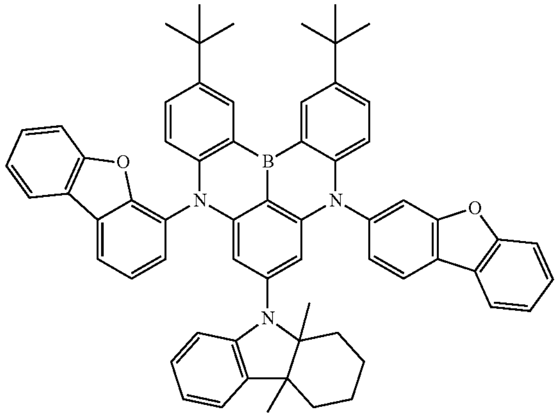

-continued
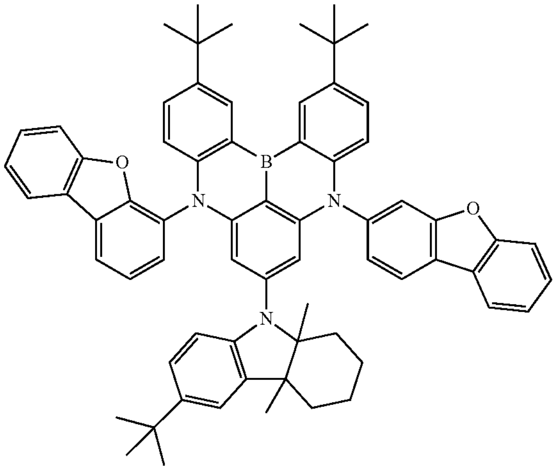
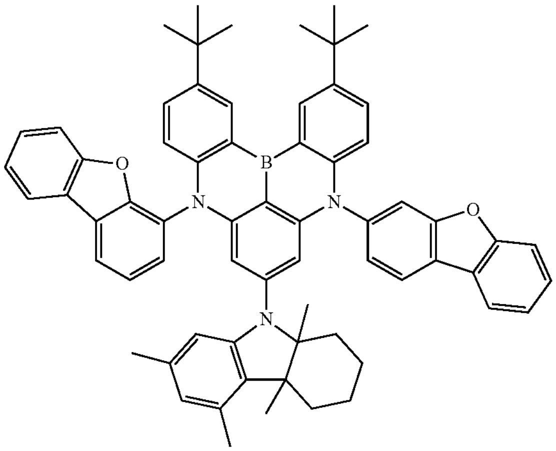
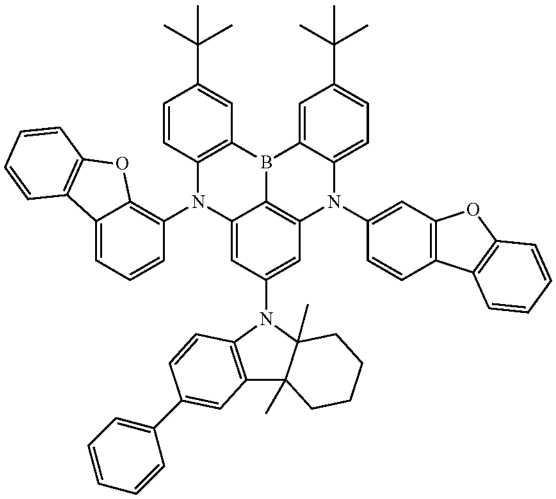
-continued
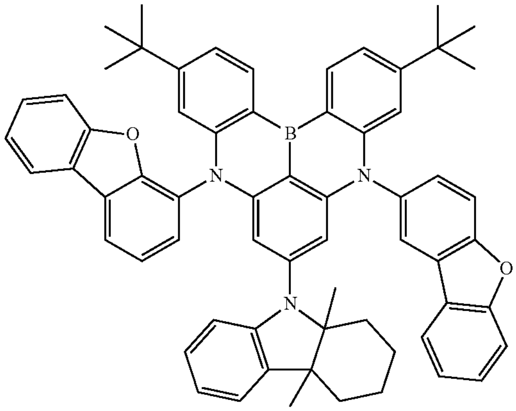
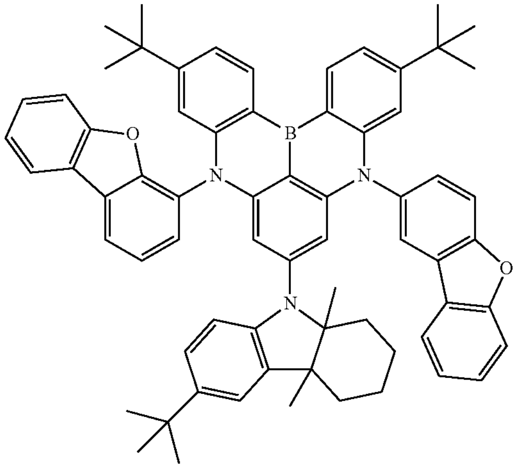
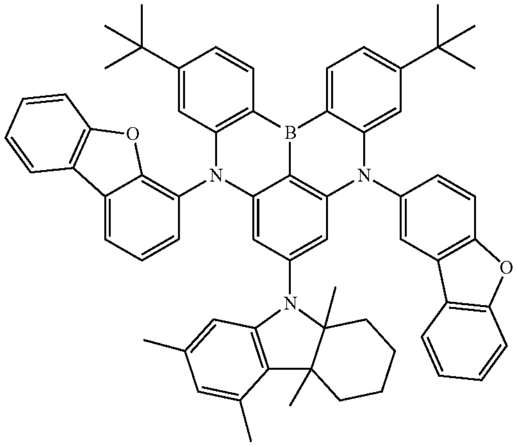

-continued
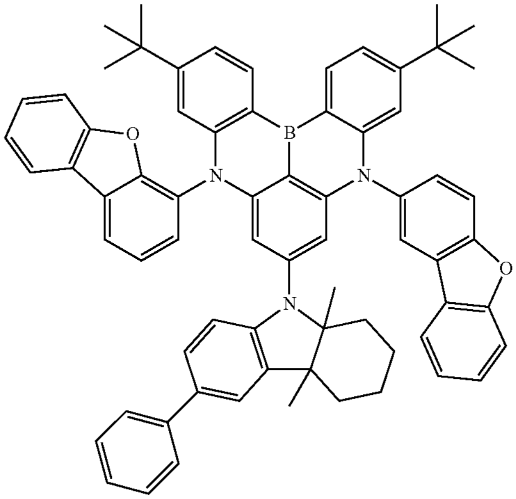
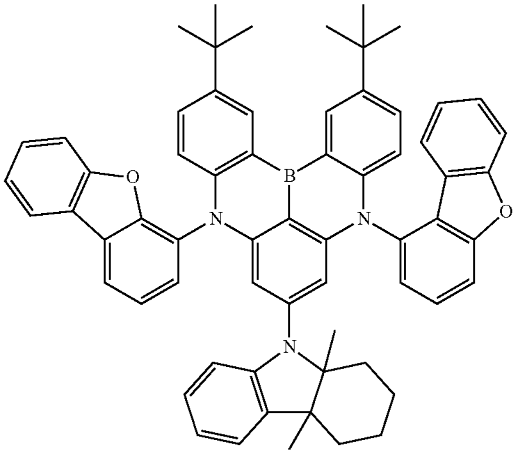
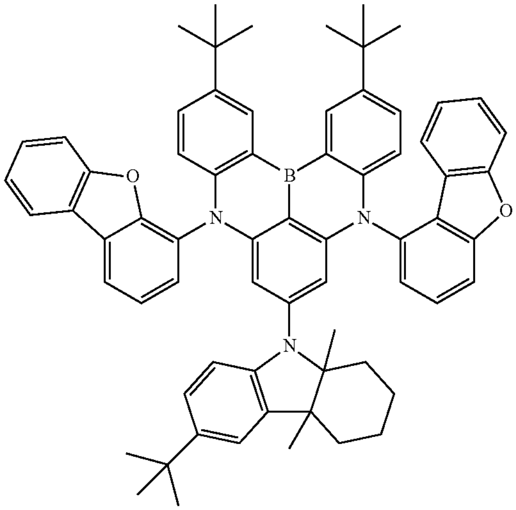
-continued
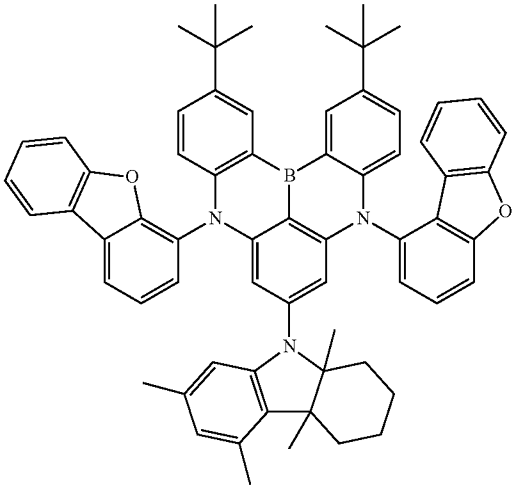
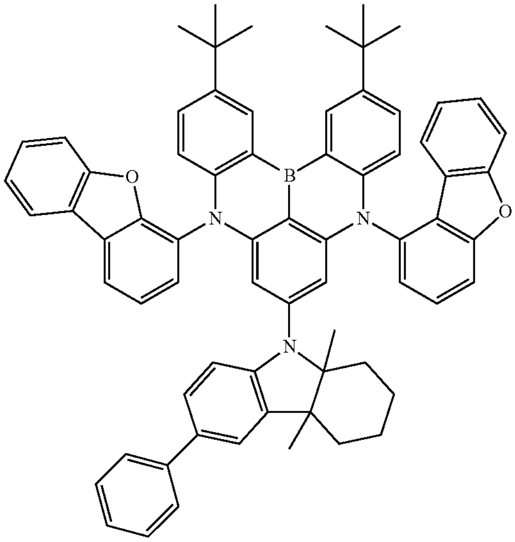
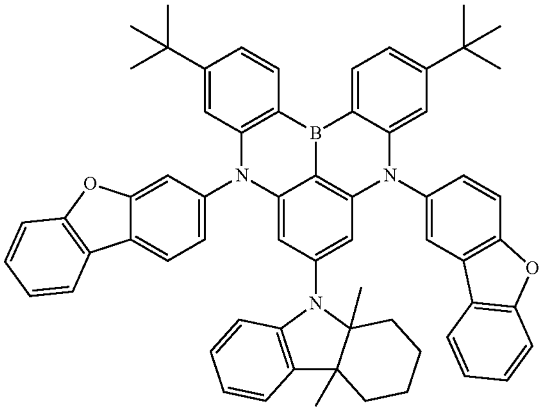

-continued
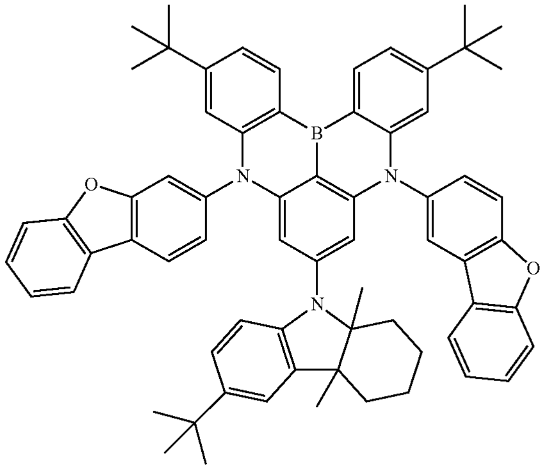
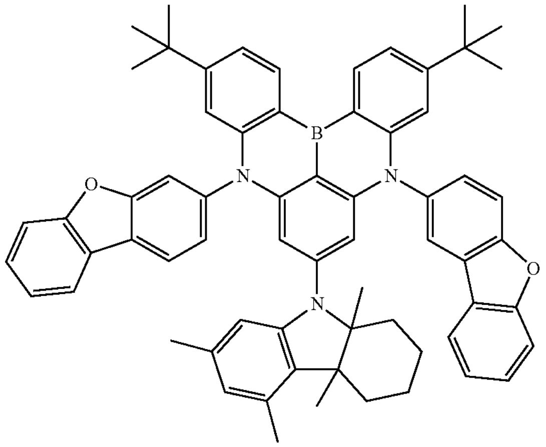
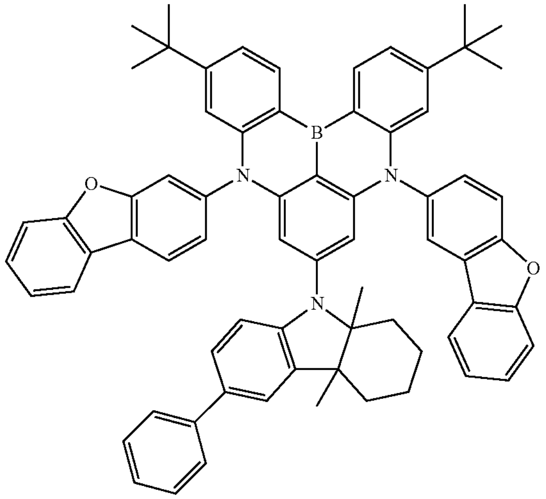
-continued
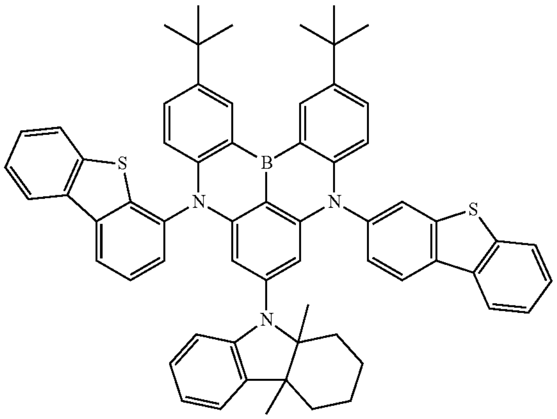
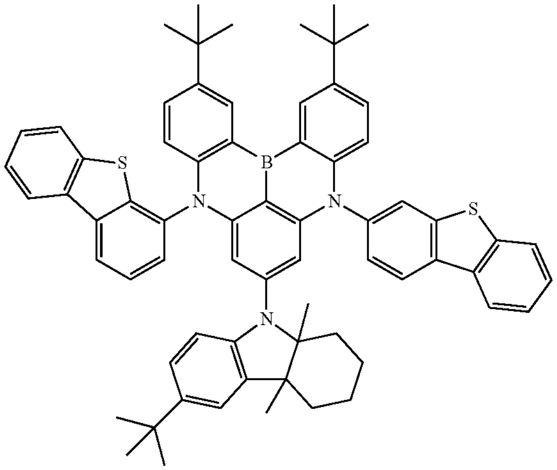
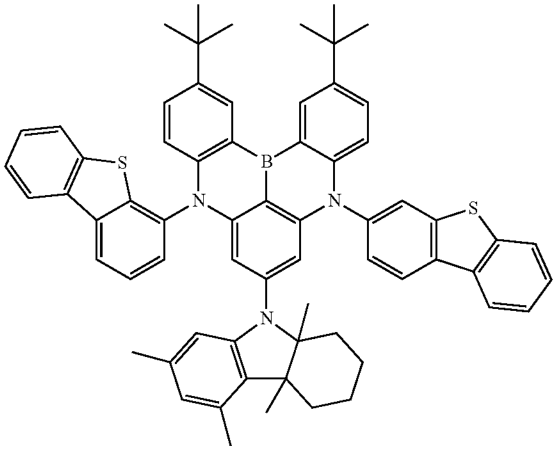

-continued
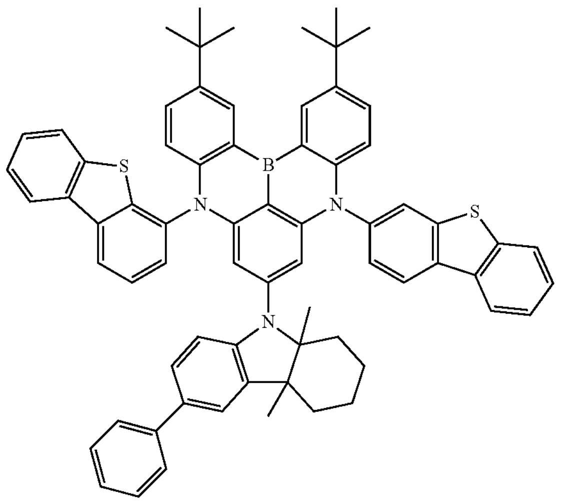
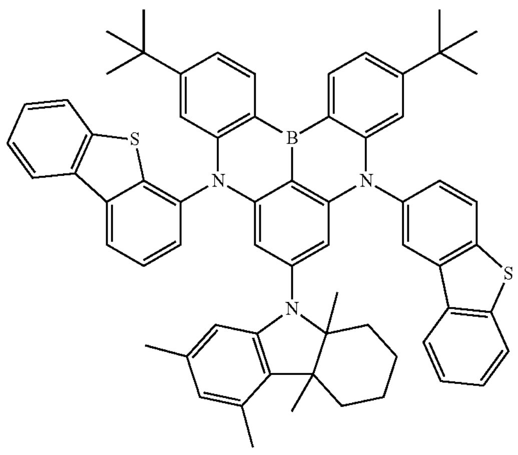
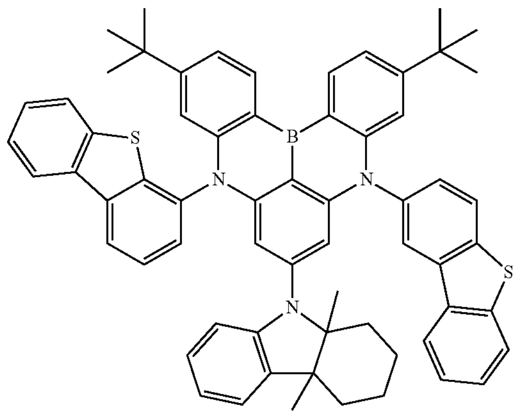
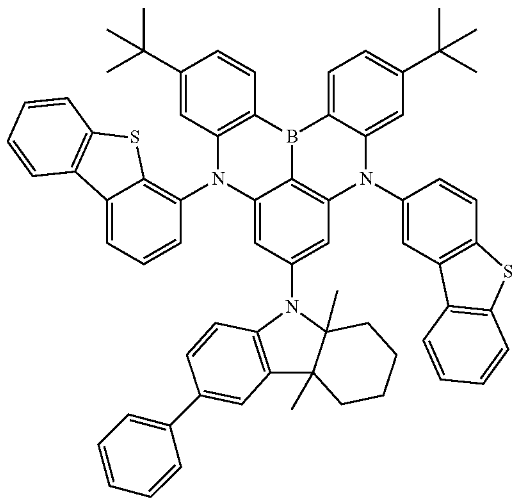
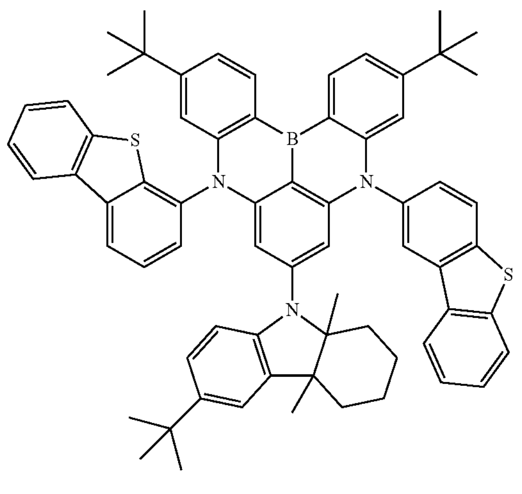
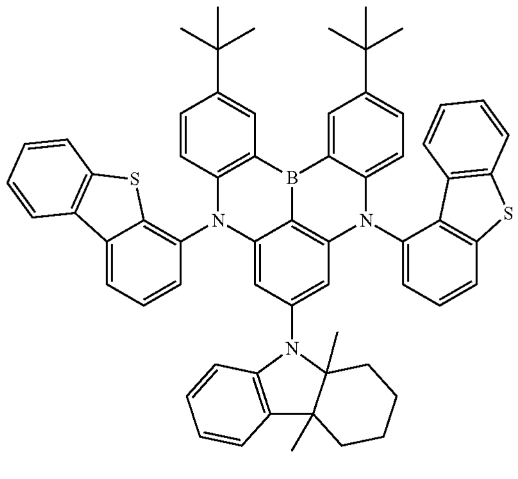

-continued
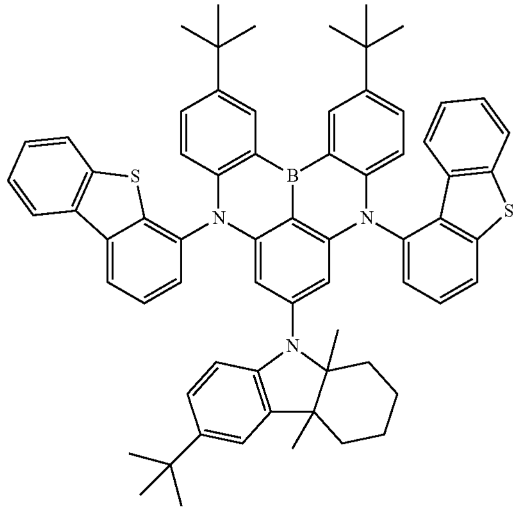
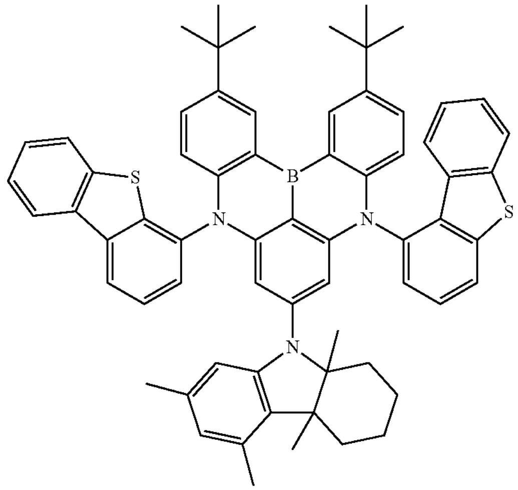
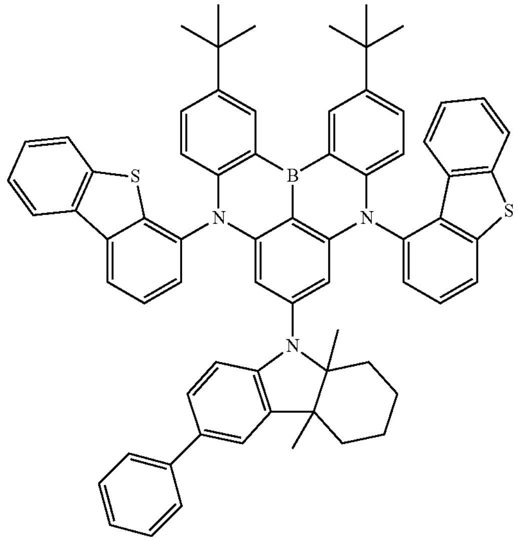
-continued
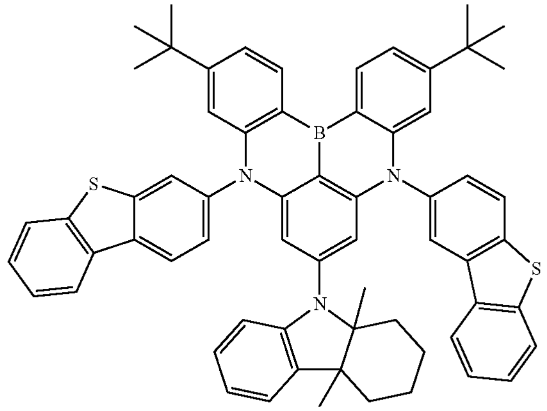
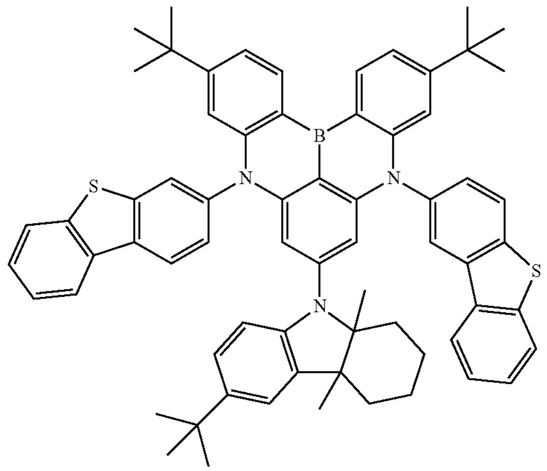
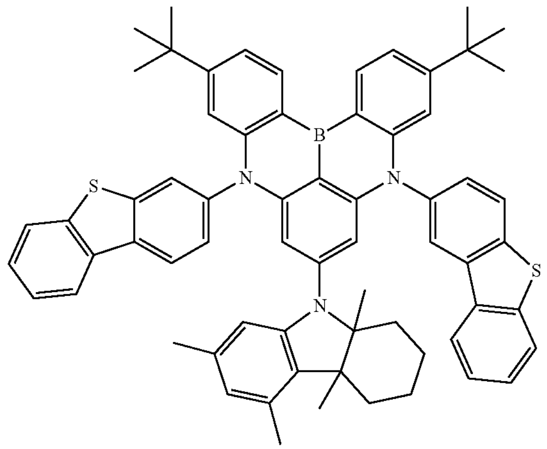

-continued
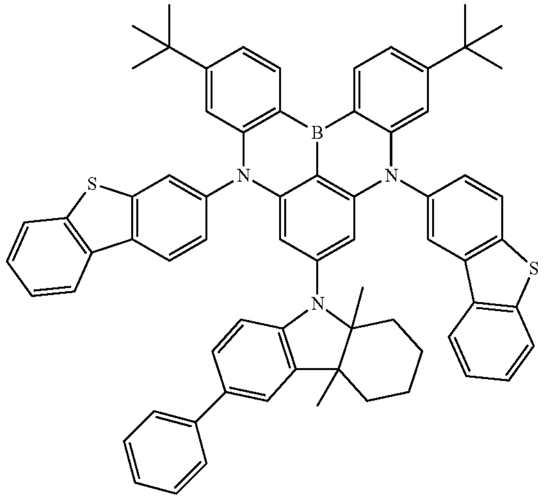
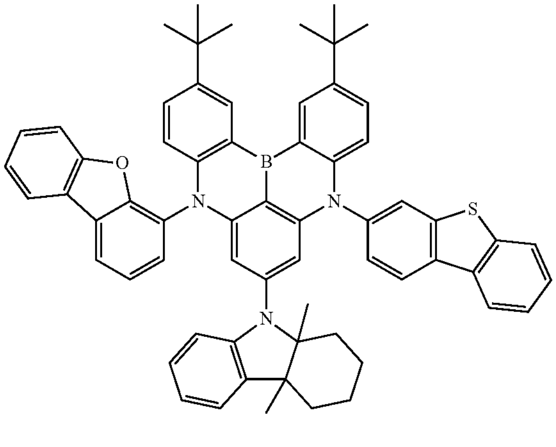
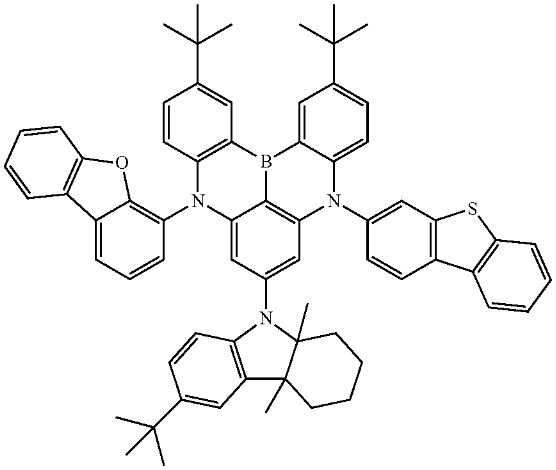
-continued
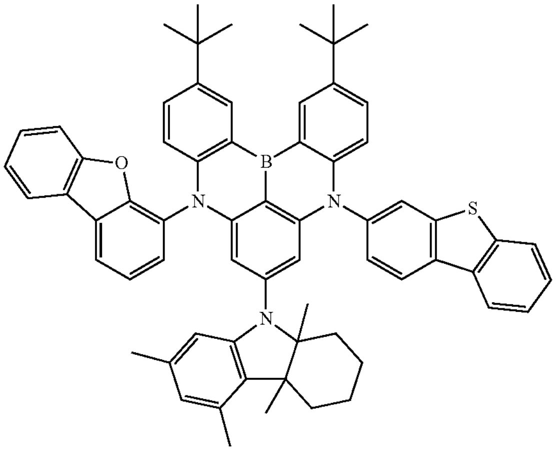
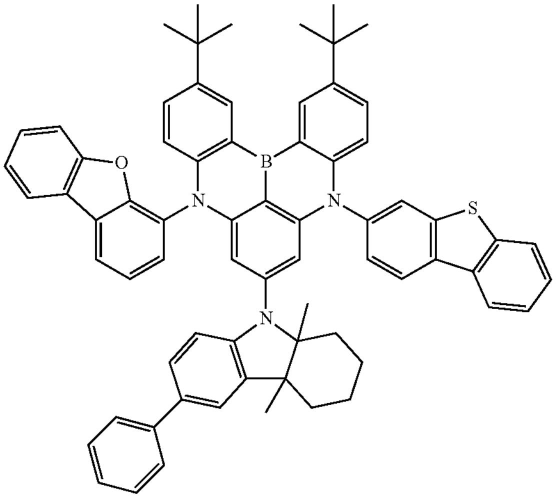
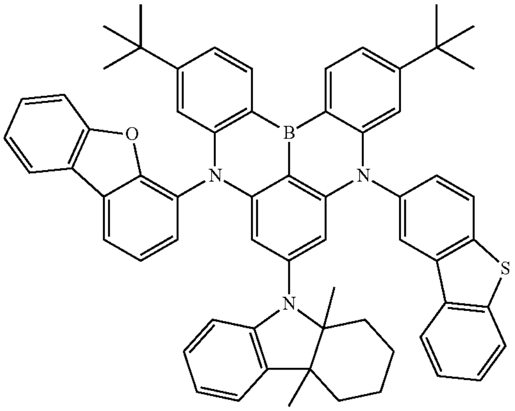

-continued
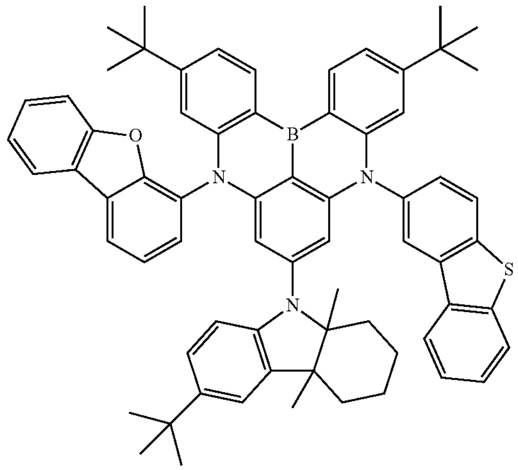
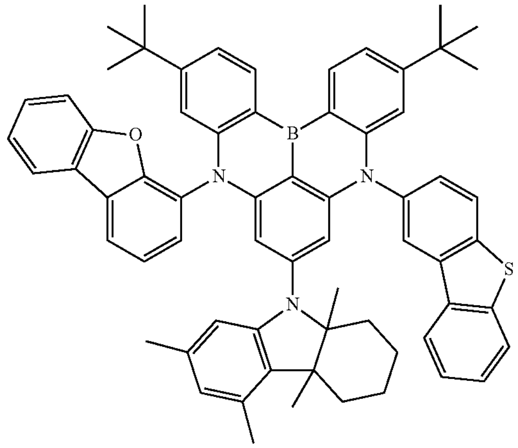
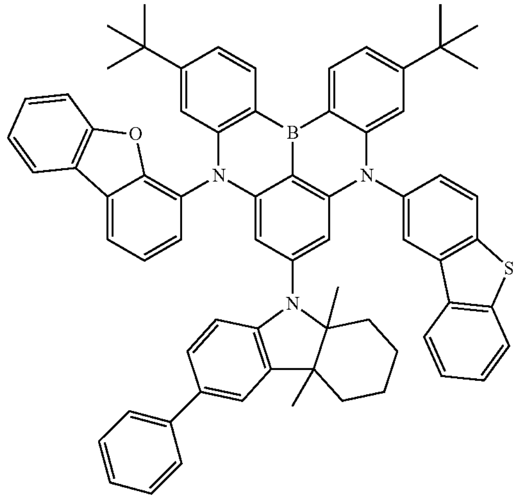
-continued
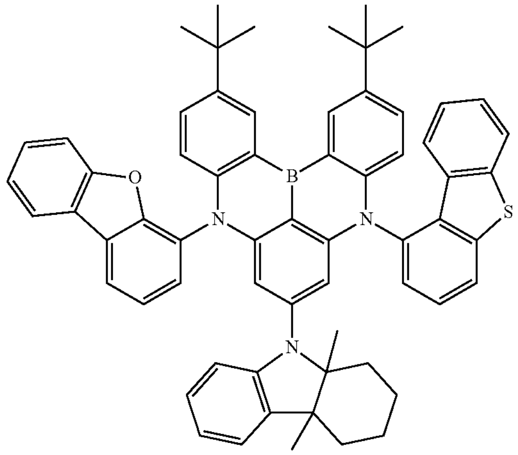
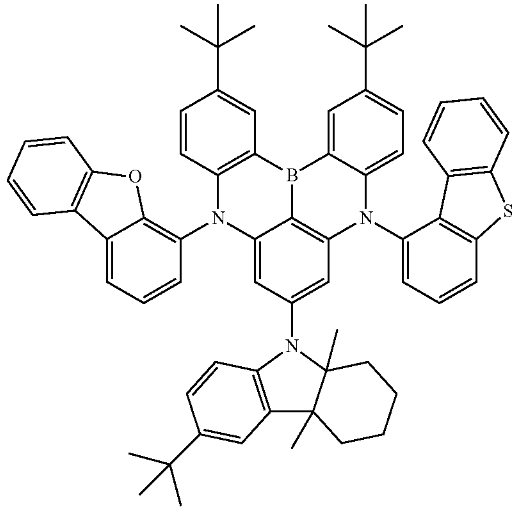
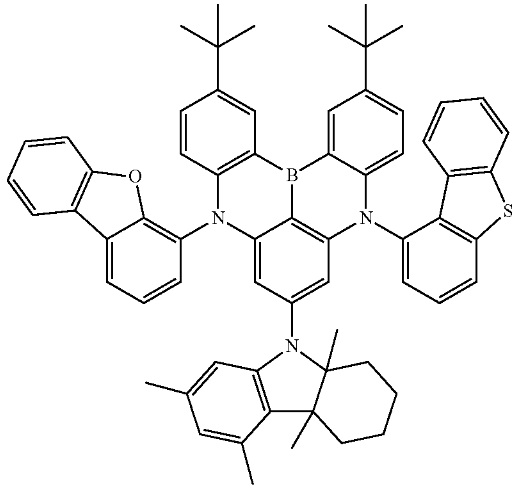

-continued
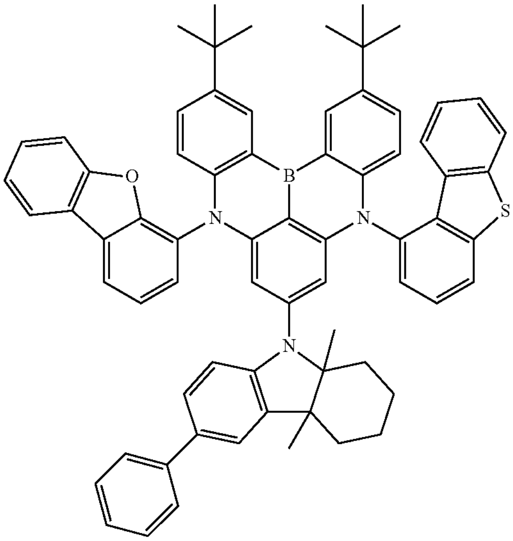
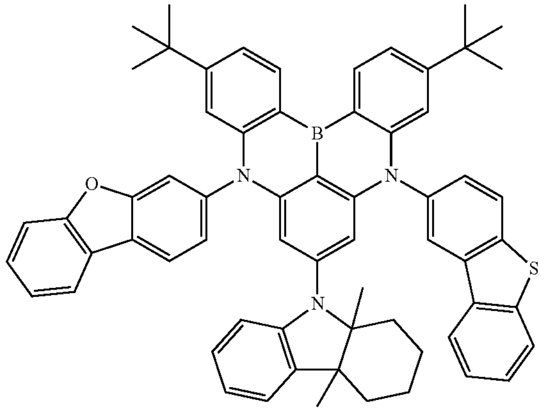
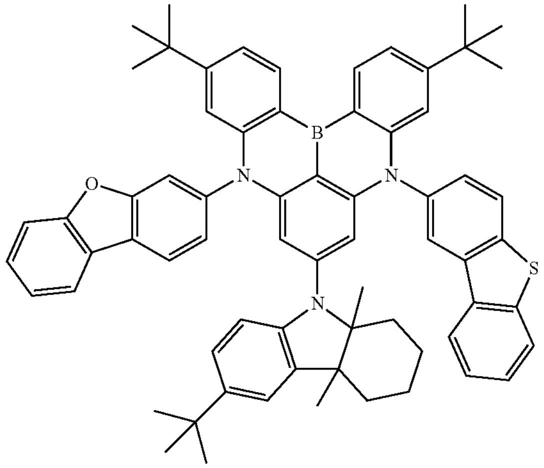
-continued
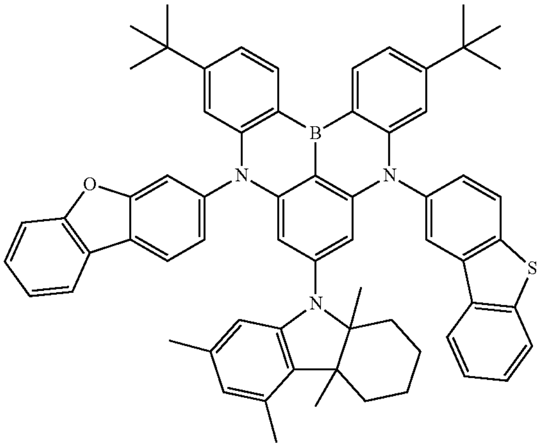
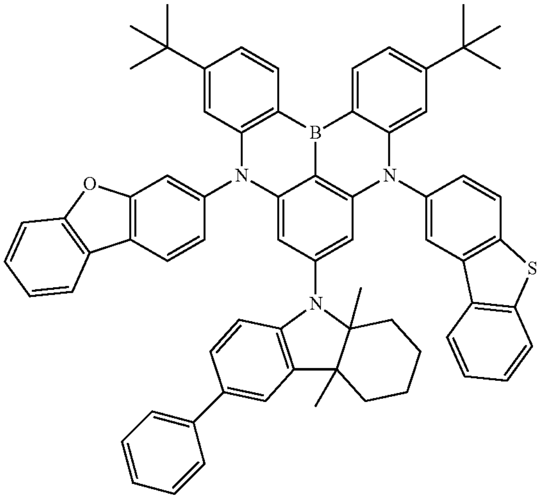
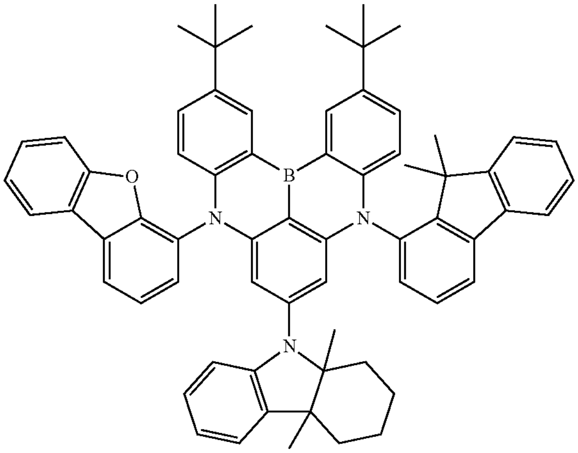

-continued
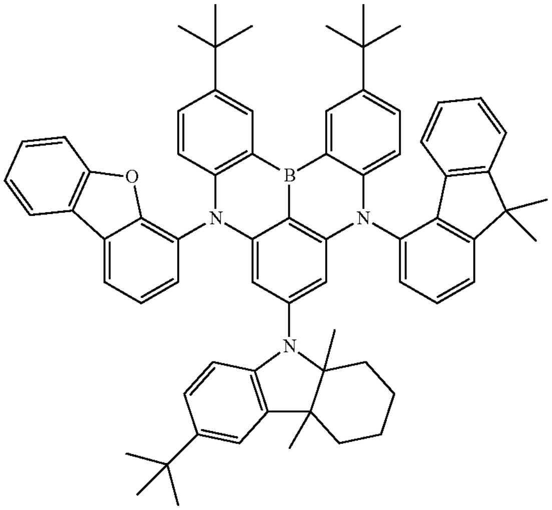
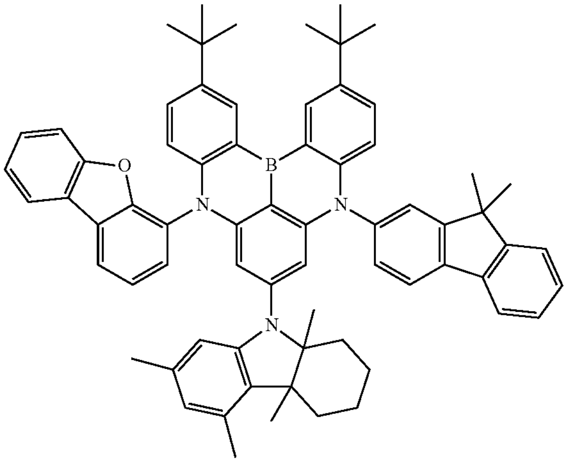
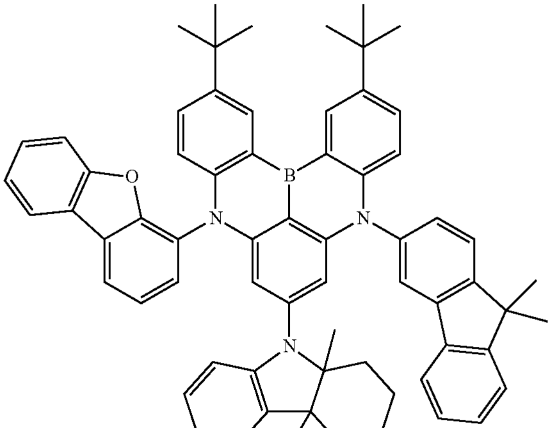
-continued
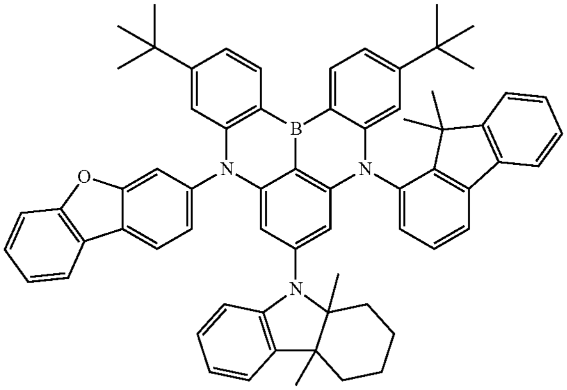
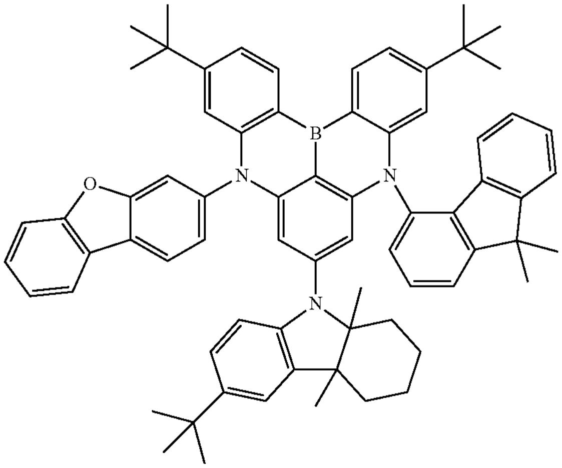
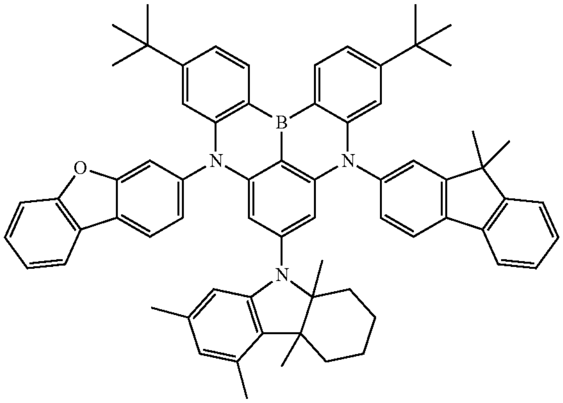

-continued
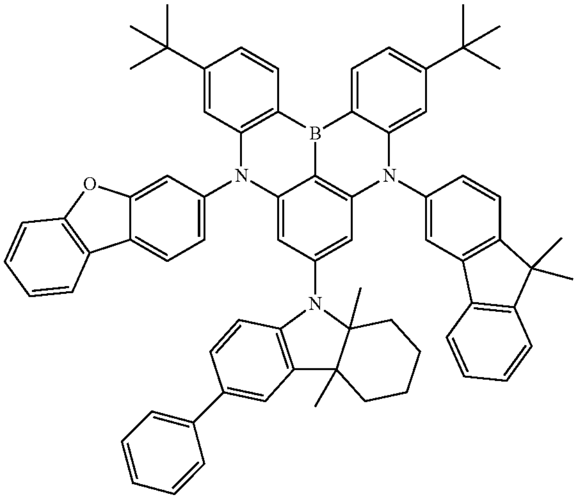
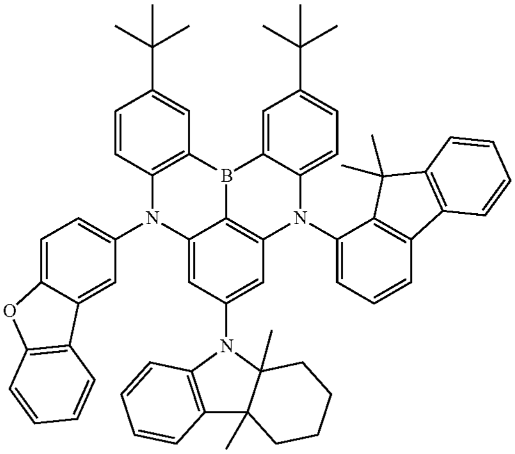
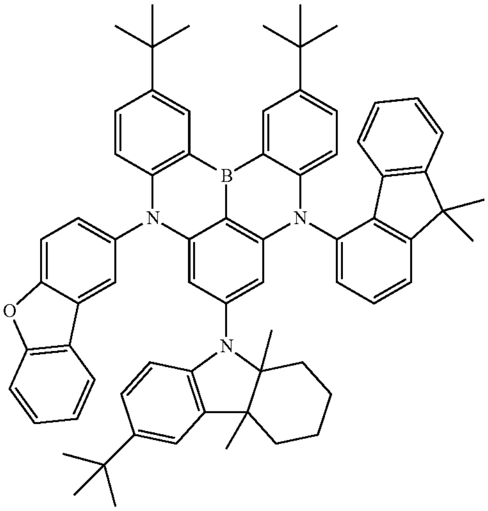
-continued
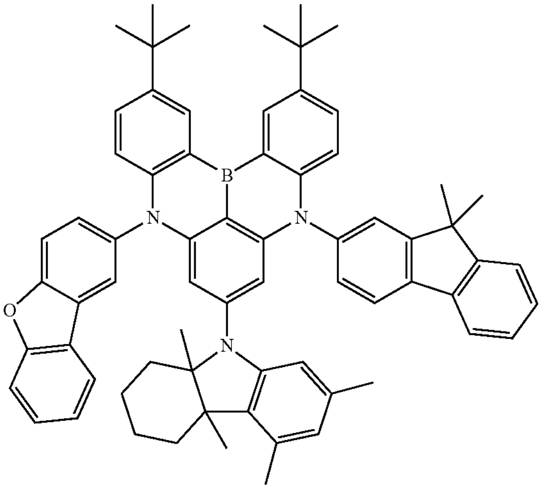
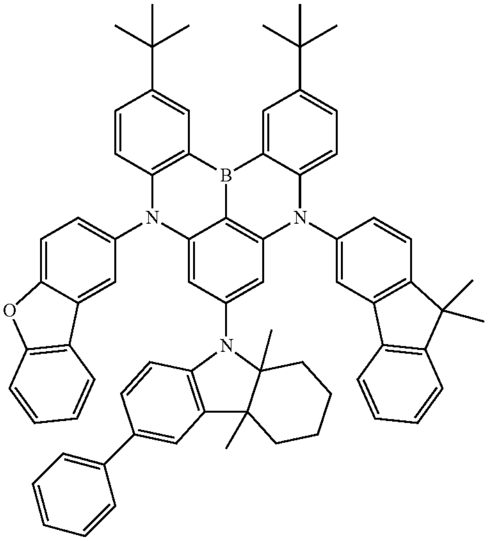
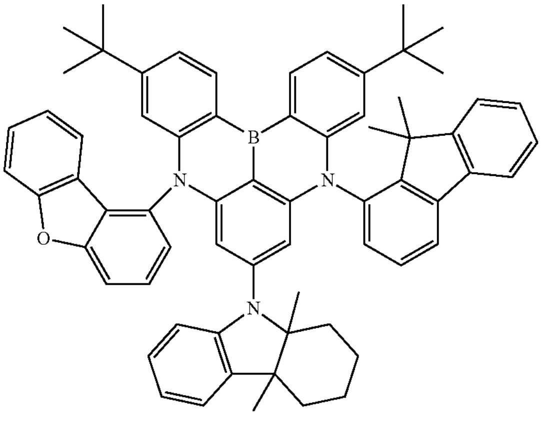

-continued
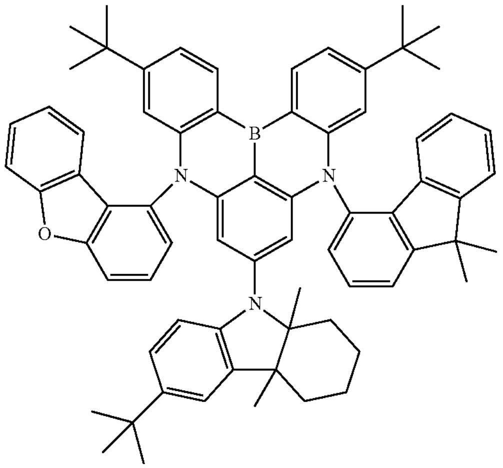
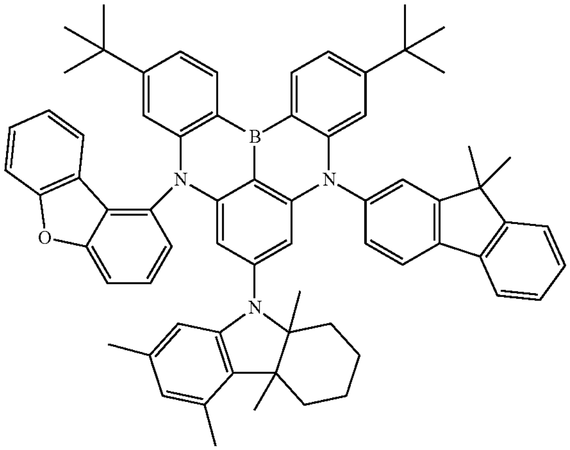
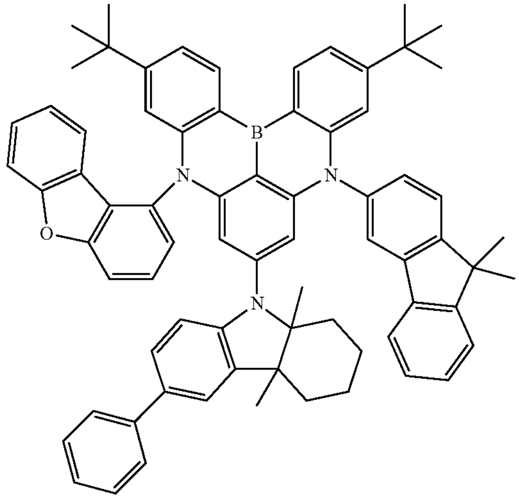
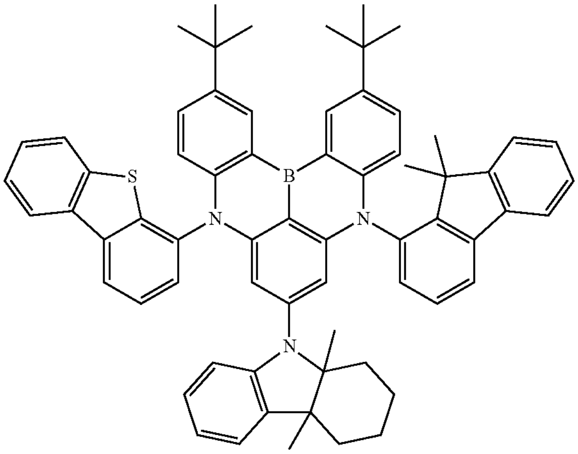
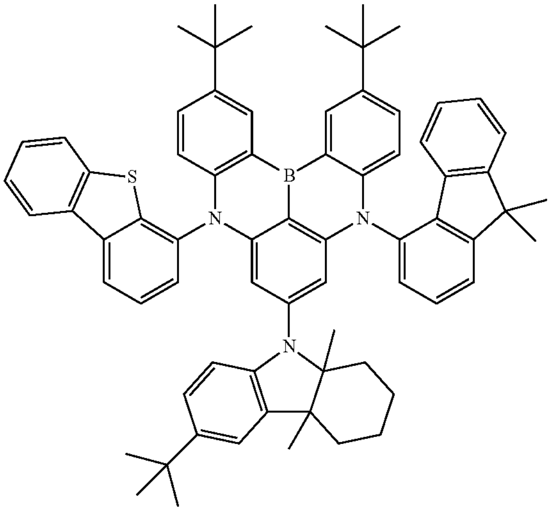
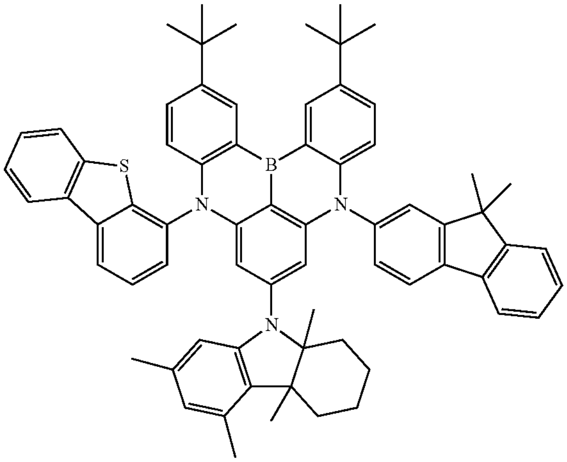

-continued
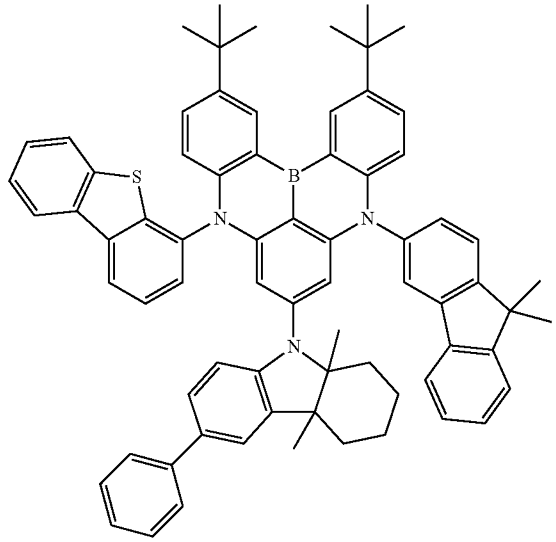
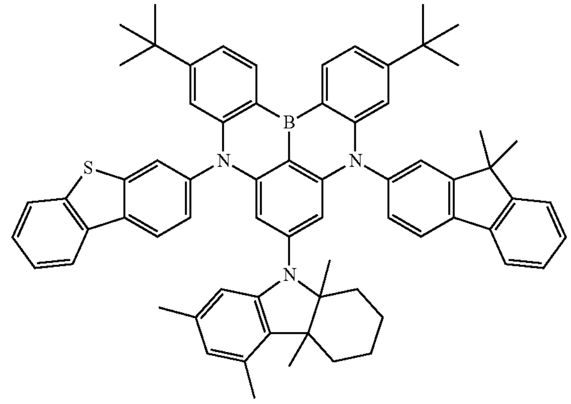
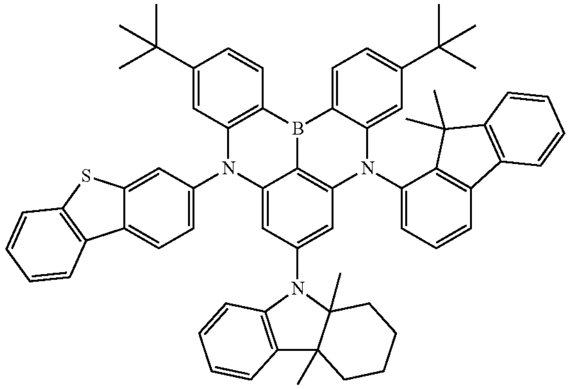
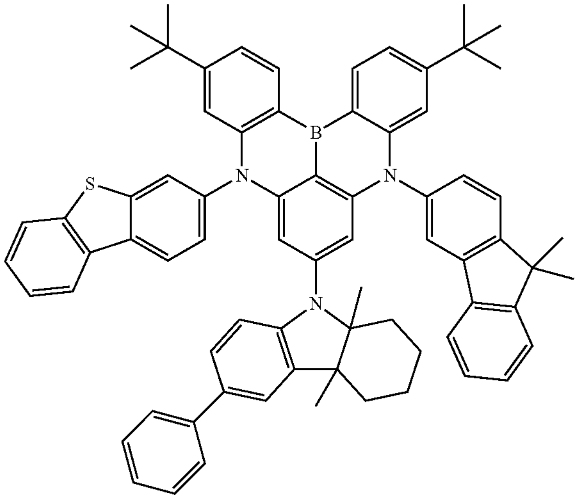
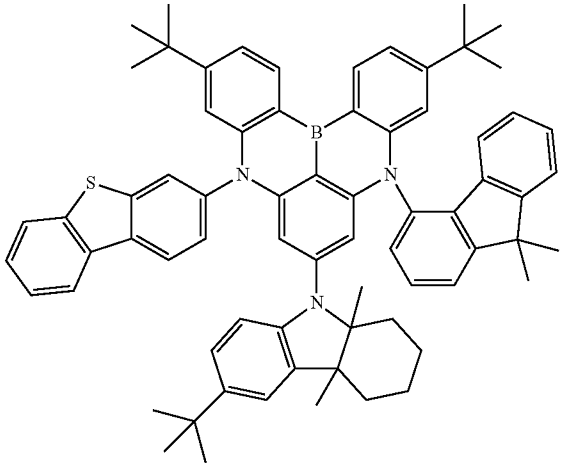
-continued
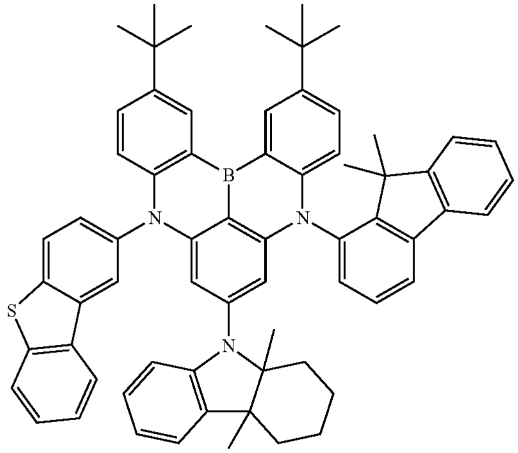

-continued
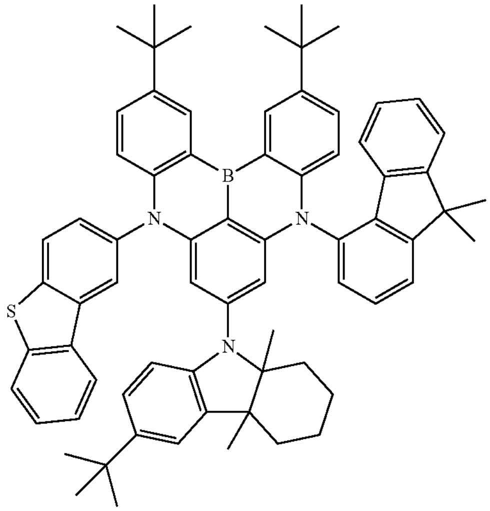
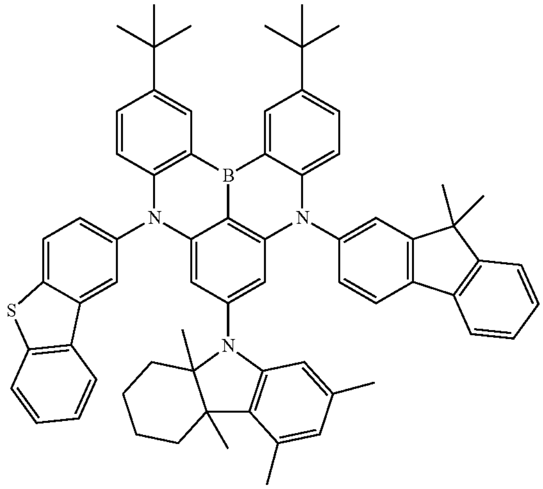
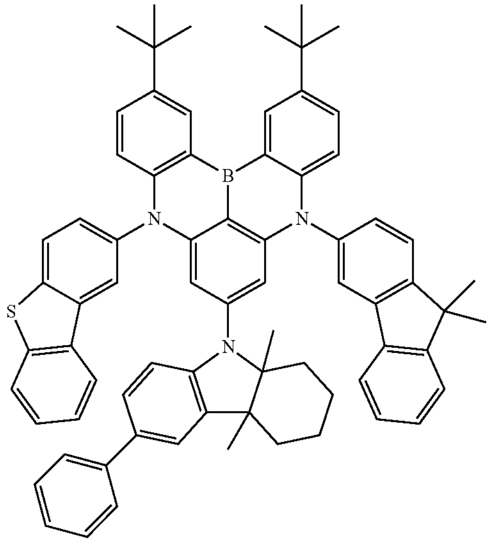
-continued
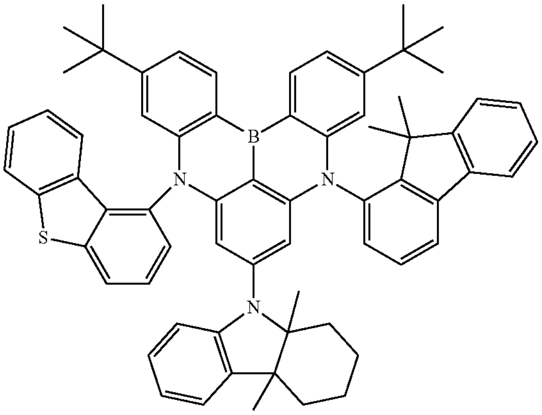
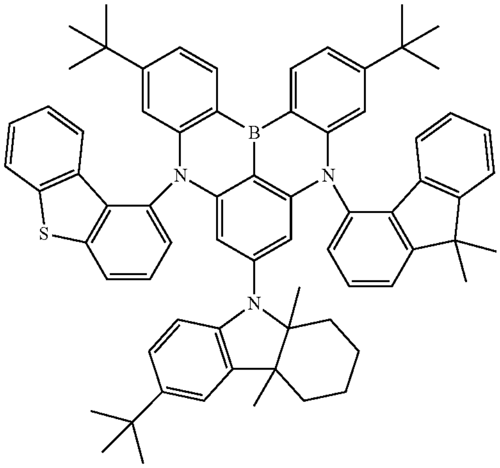
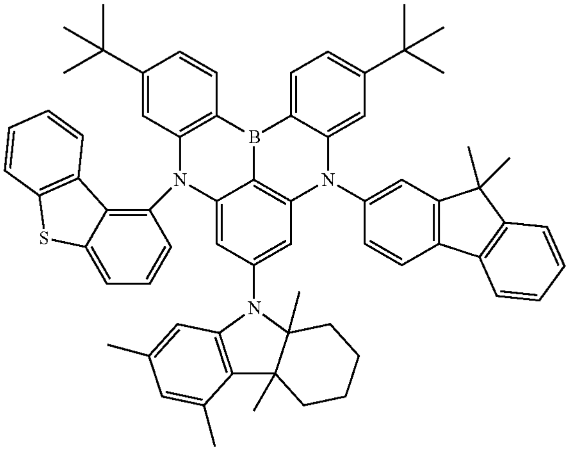

-continued
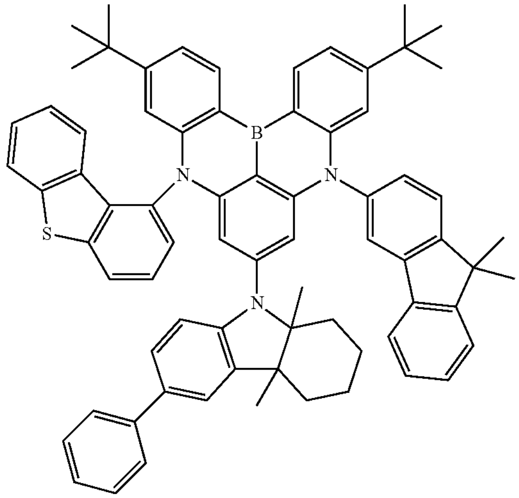
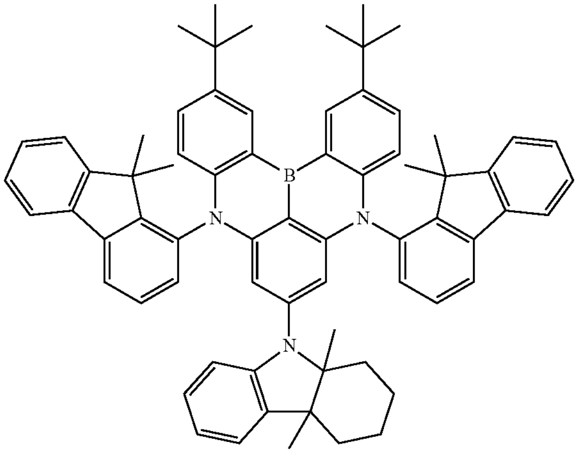
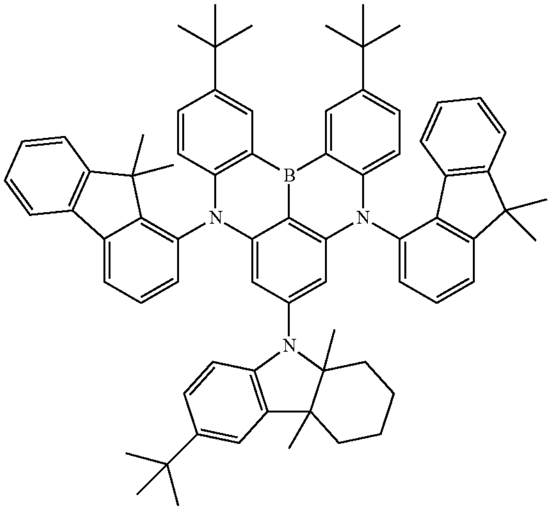
-continued
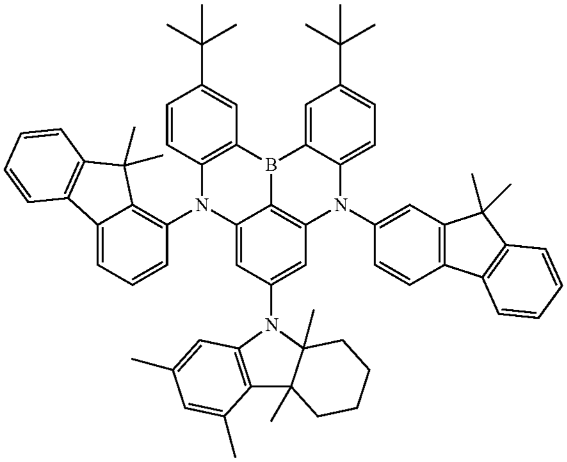
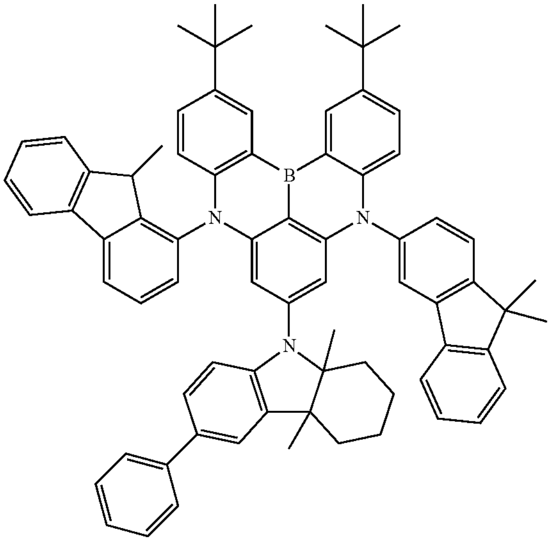
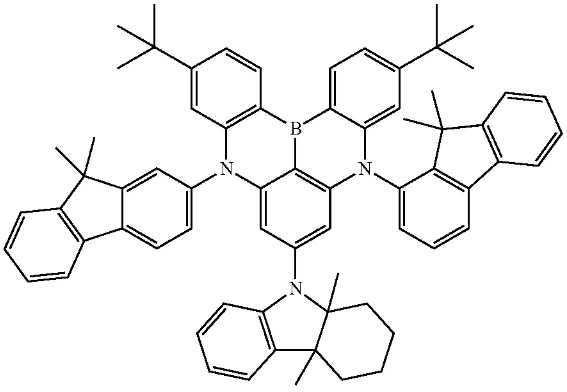

-continued
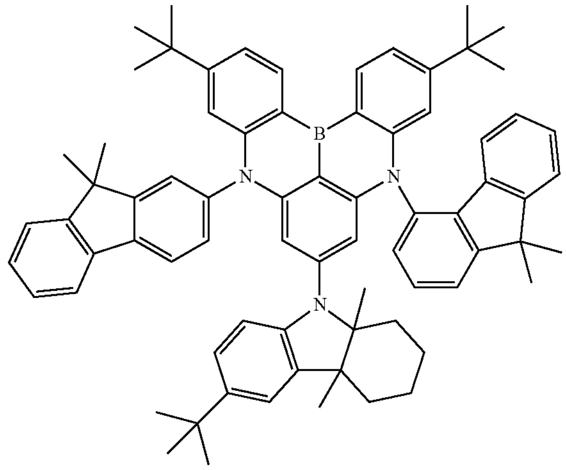
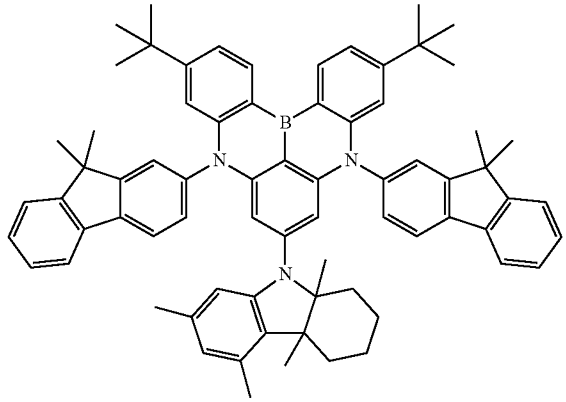
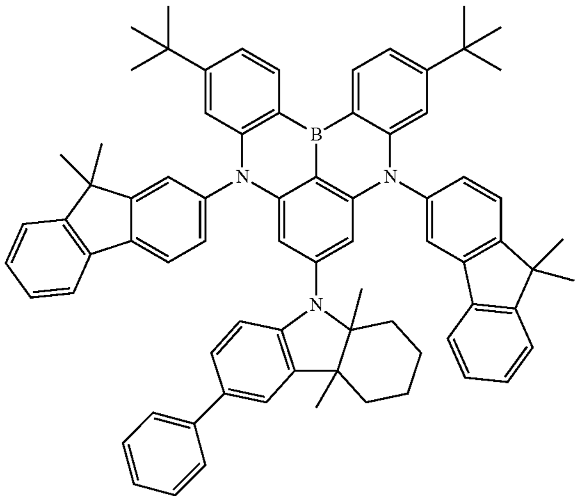
-continued
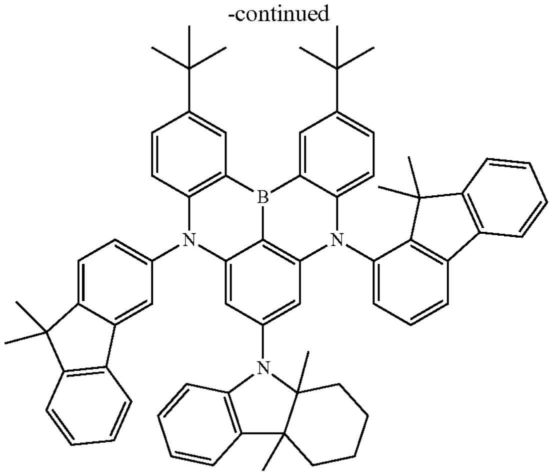
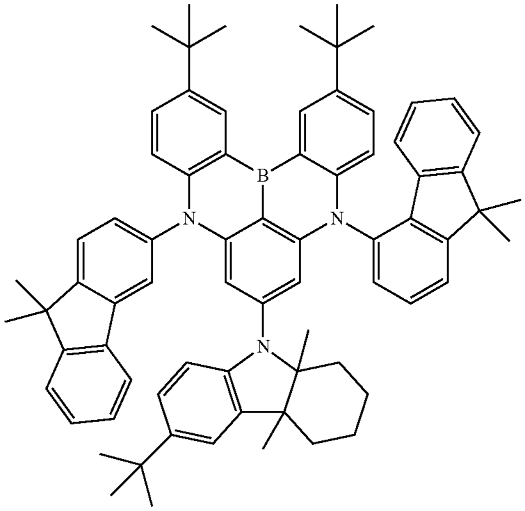
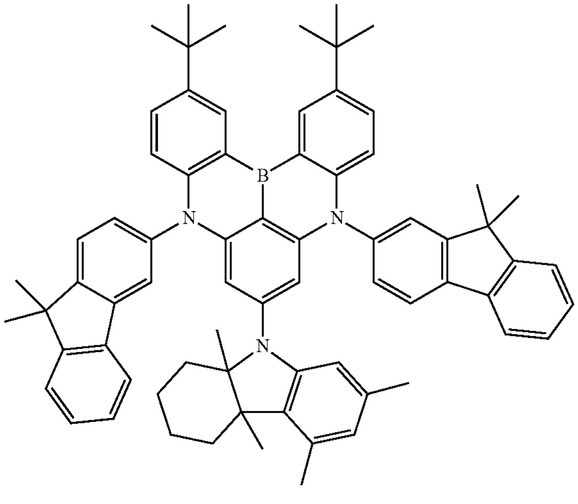

-continued
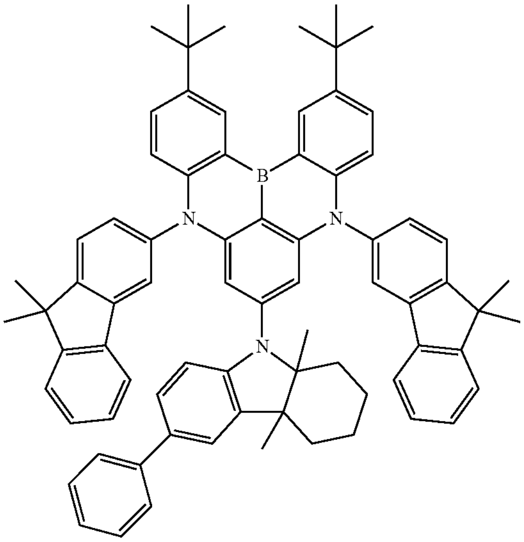
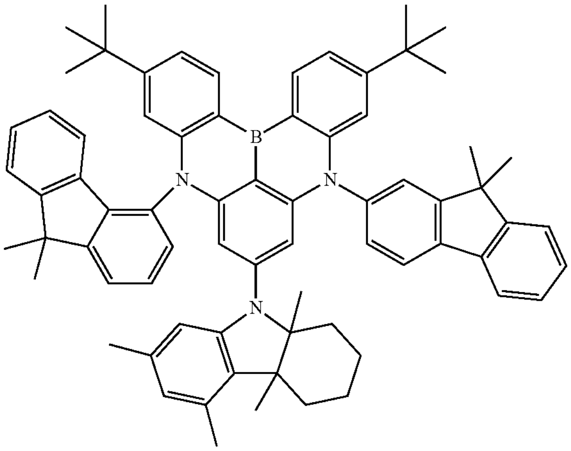
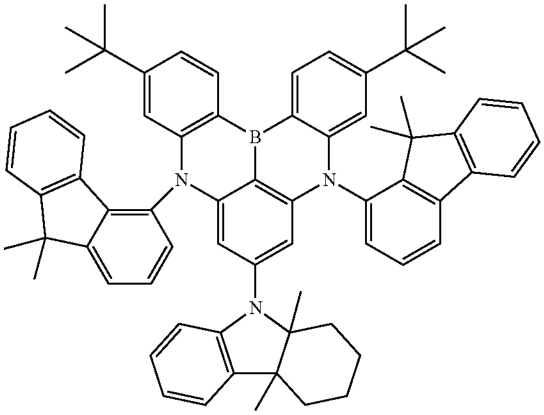
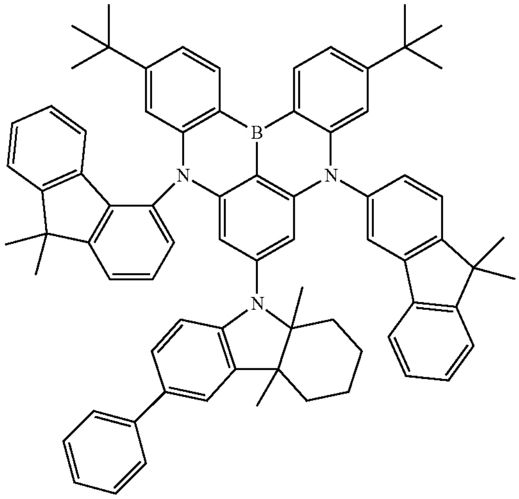
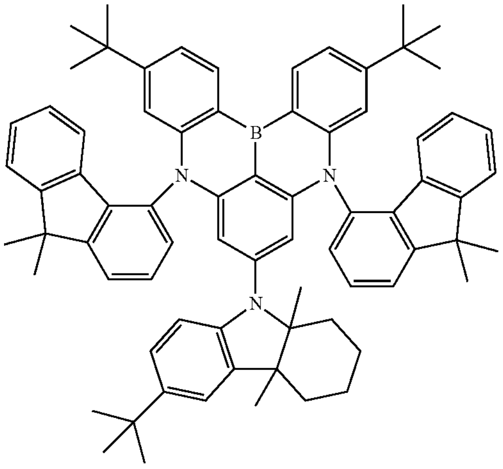
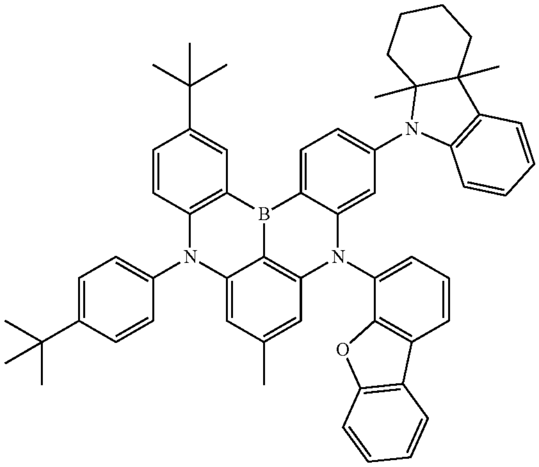
-continued -continued
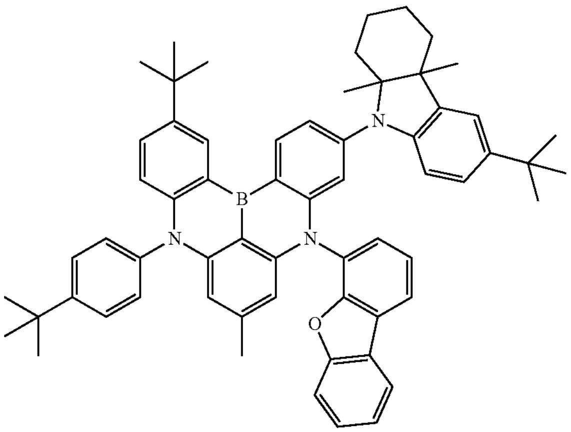
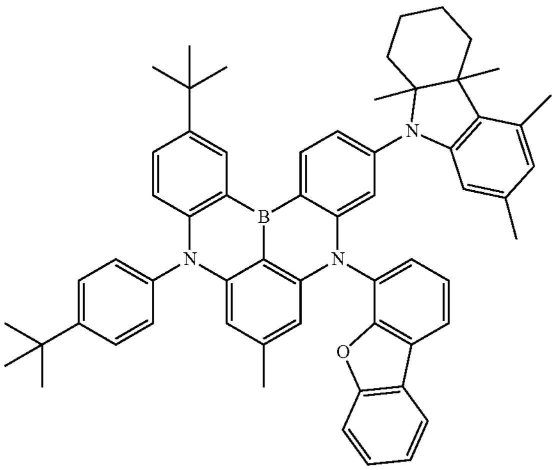
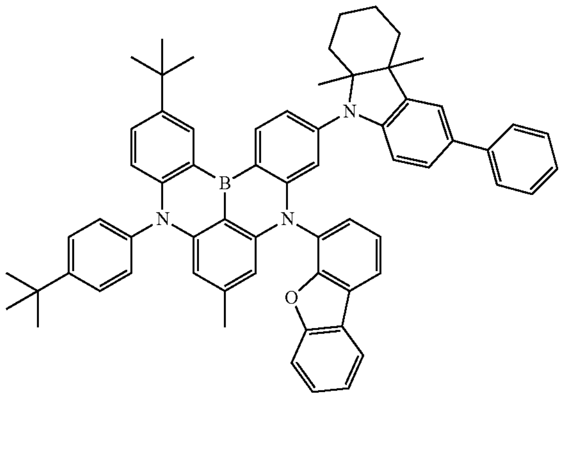
-continued
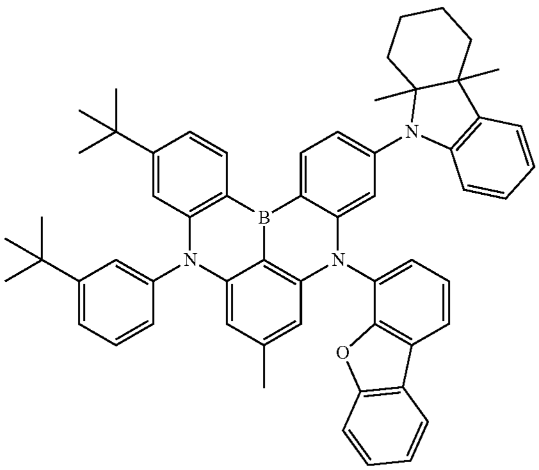
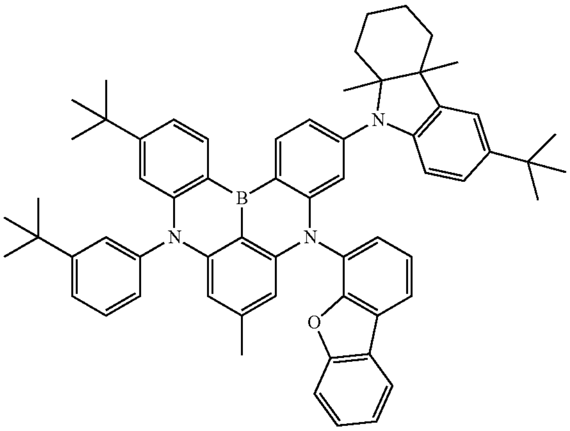
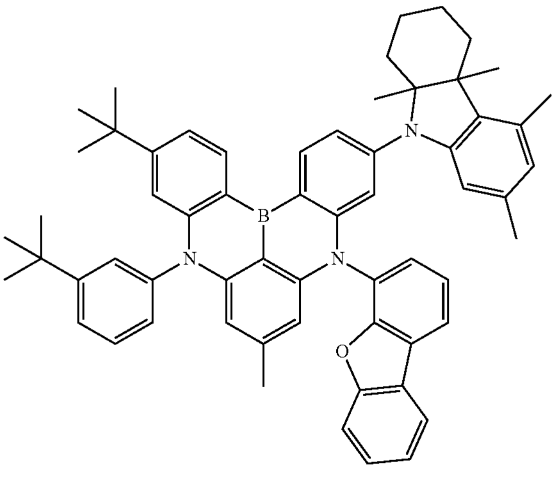

-continued
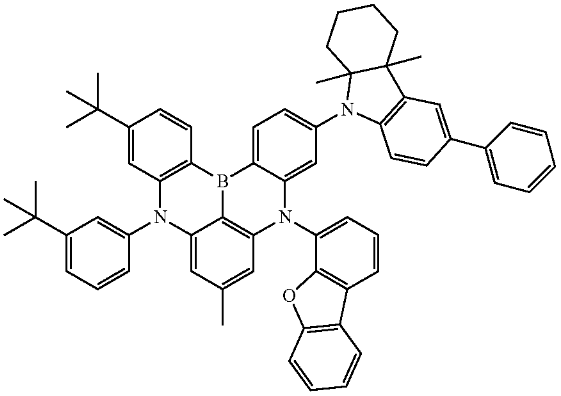
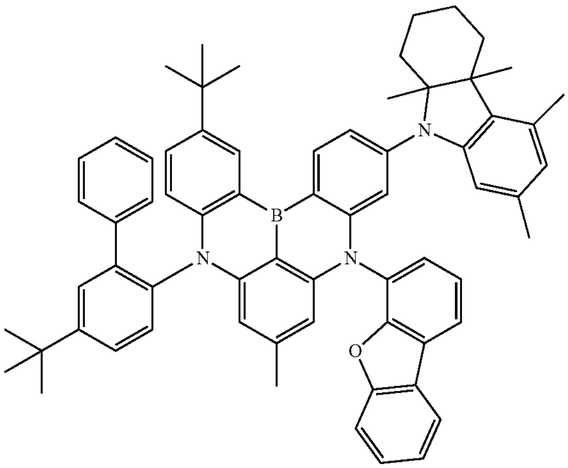
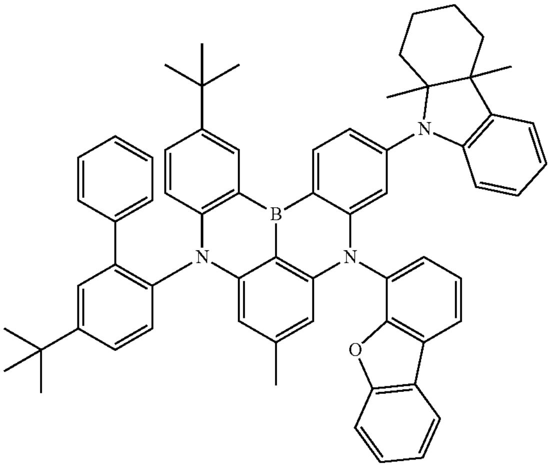
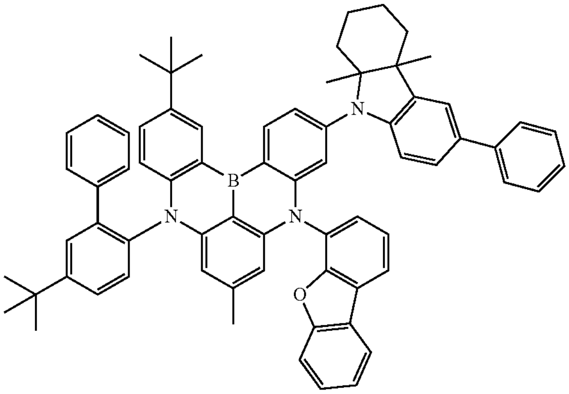
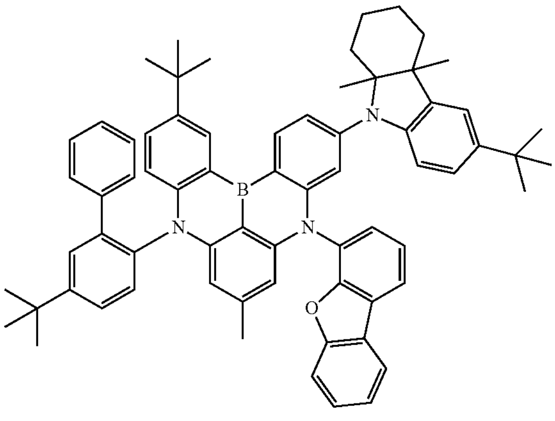
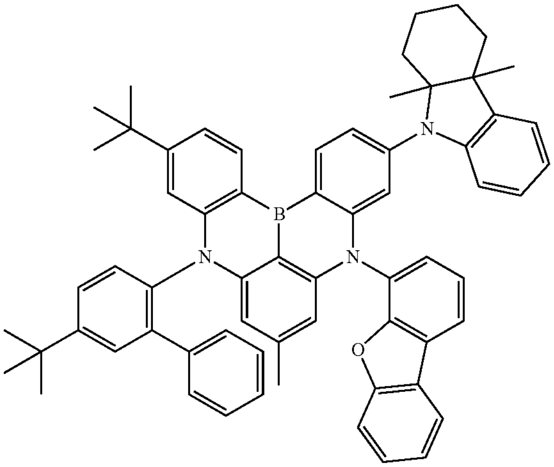
-continued

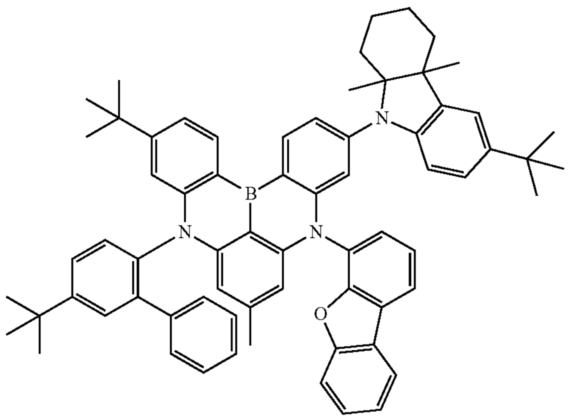
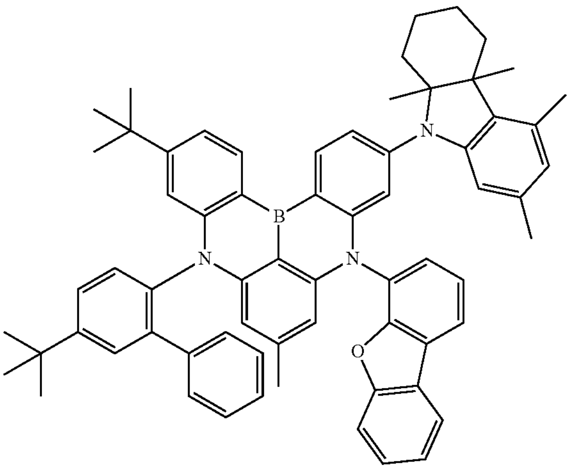
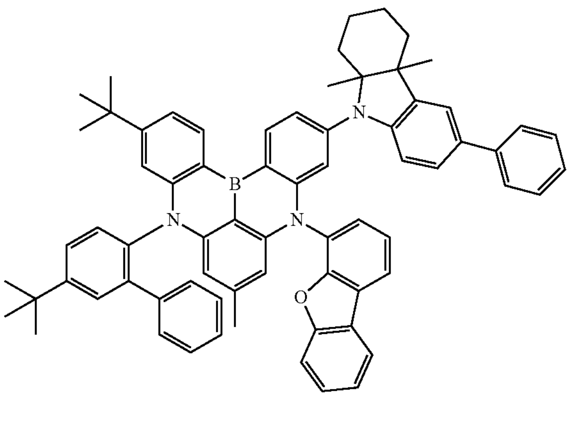
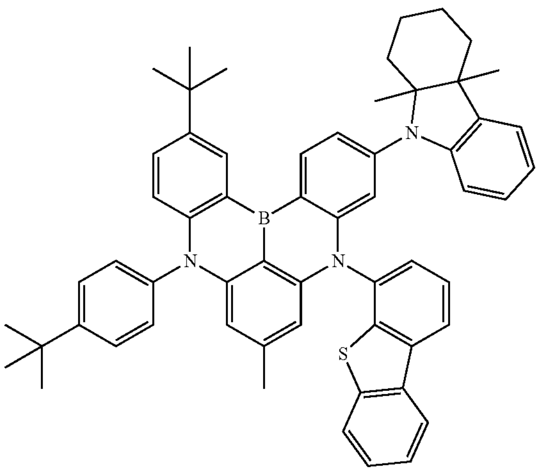
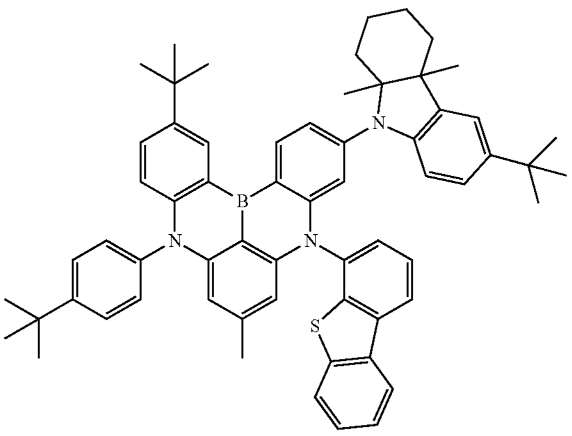
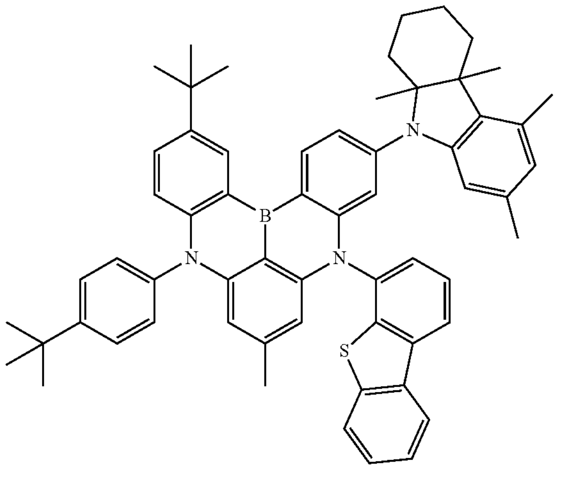

-continued
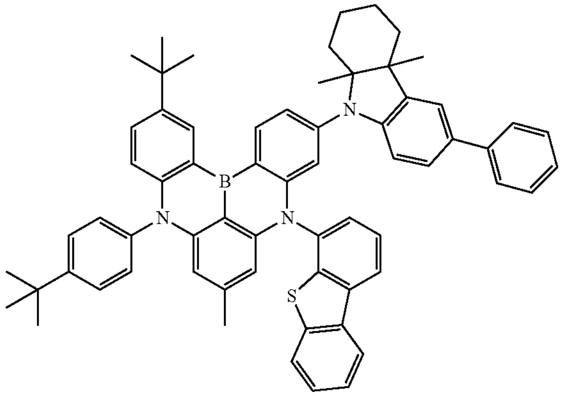
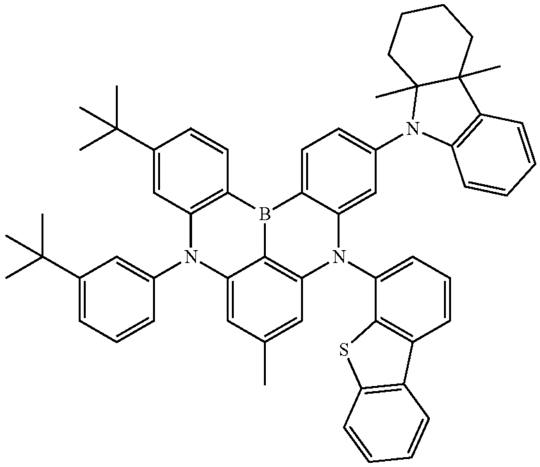
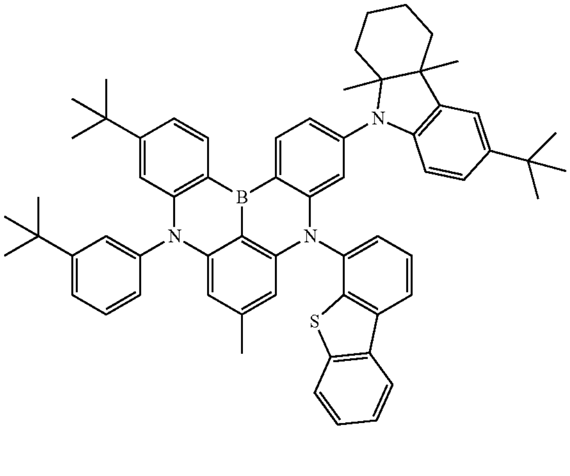
-continued
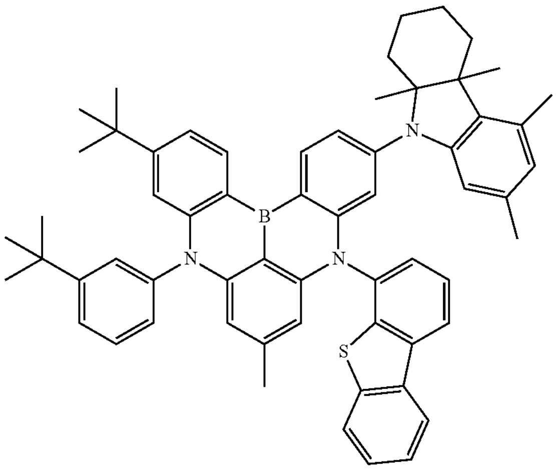
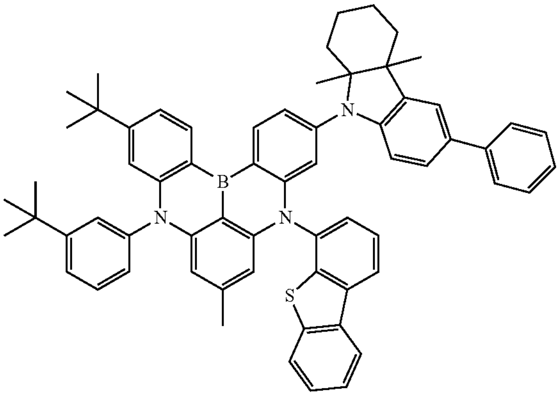
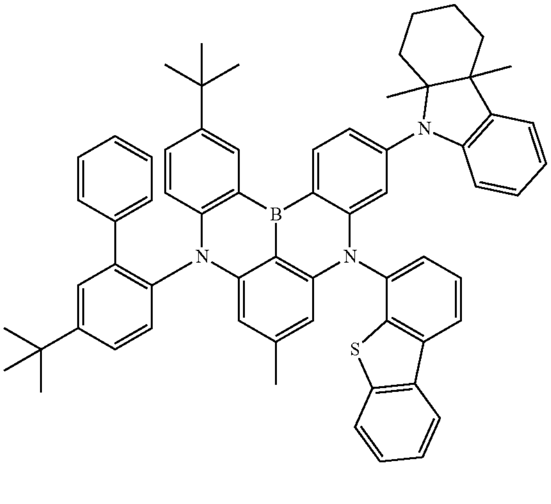

-continued
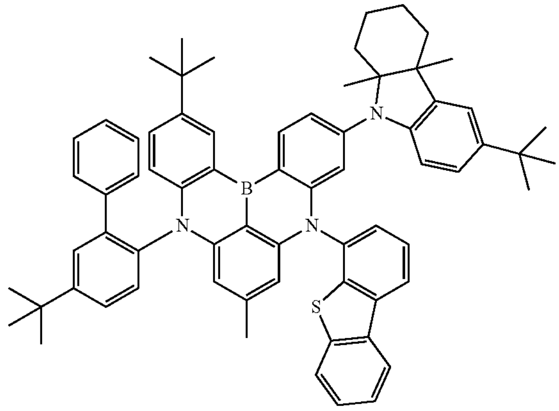
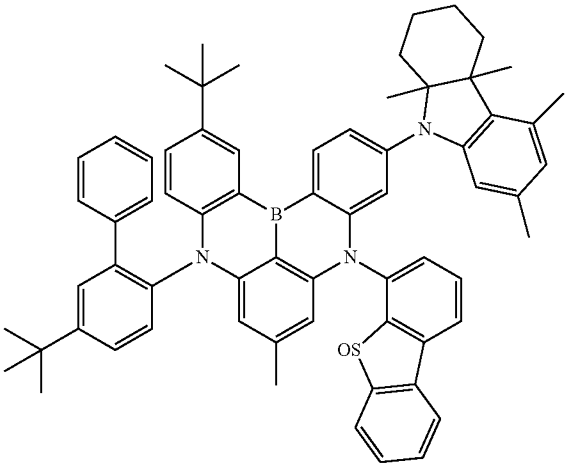
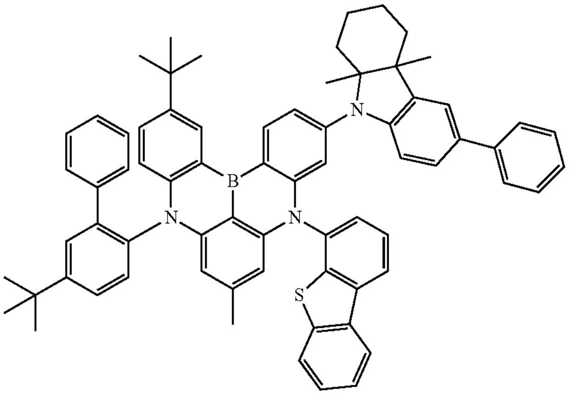
-continued
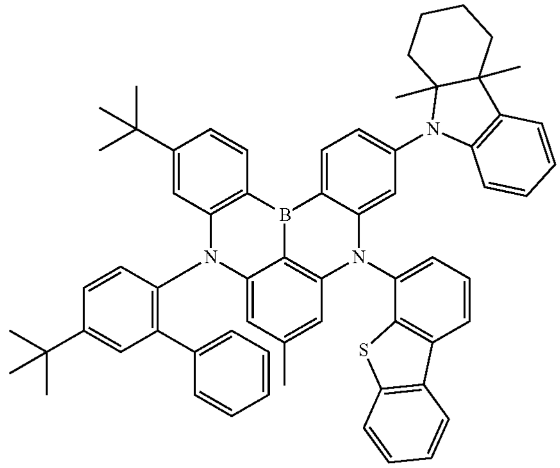
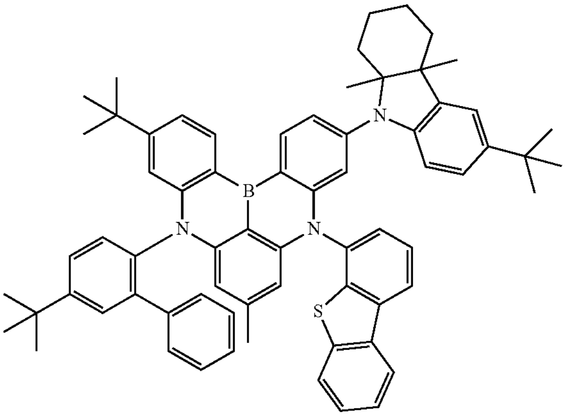
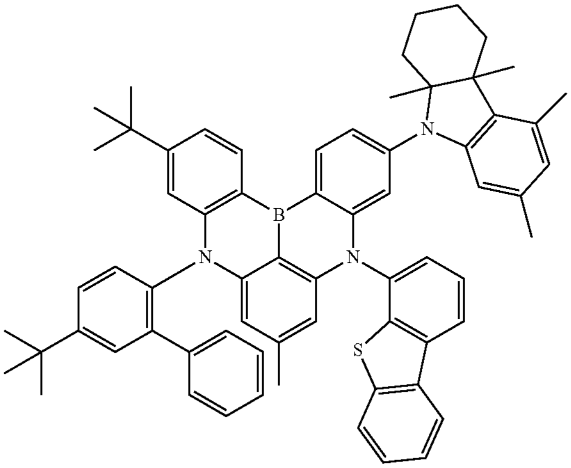

-continued
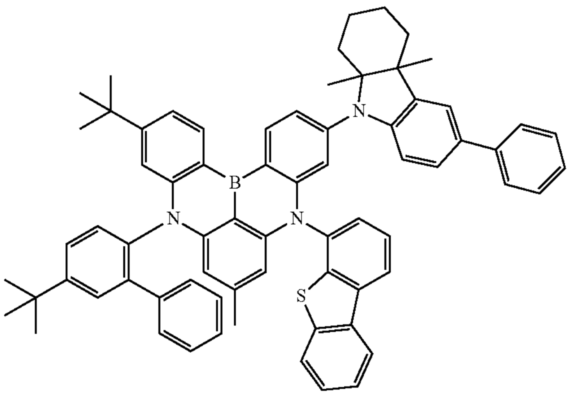
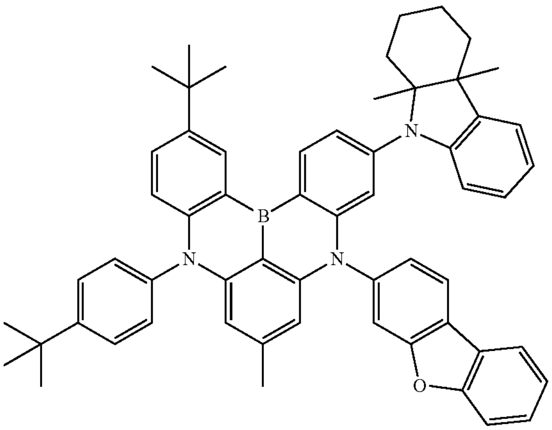
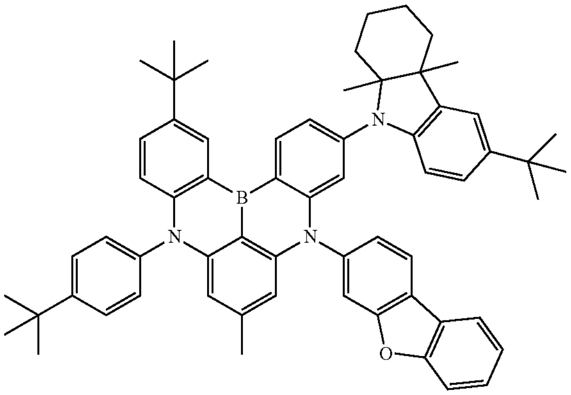
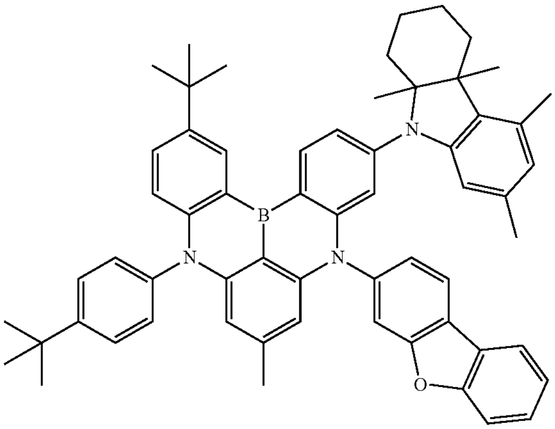
-continued
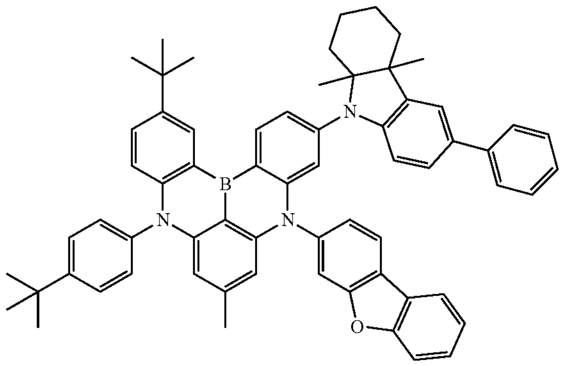
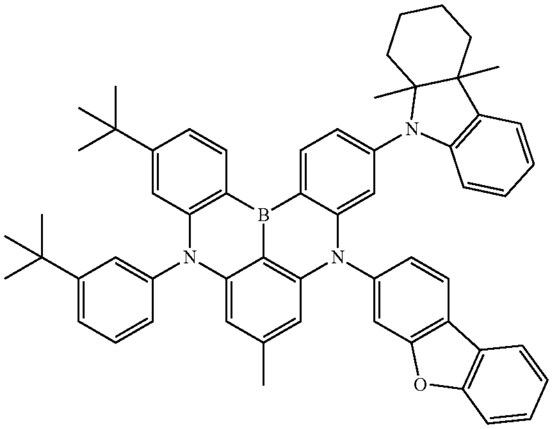
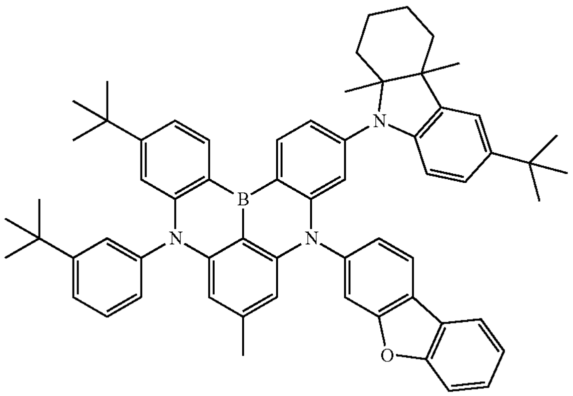
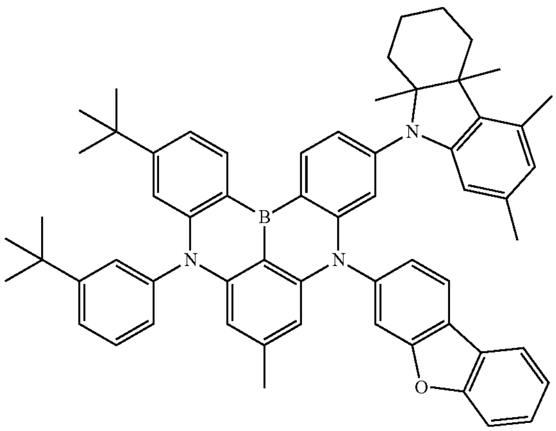

-continued
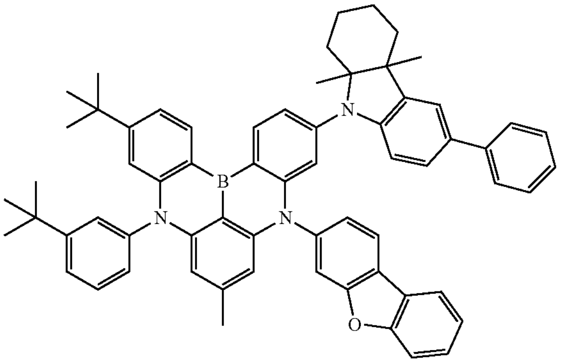
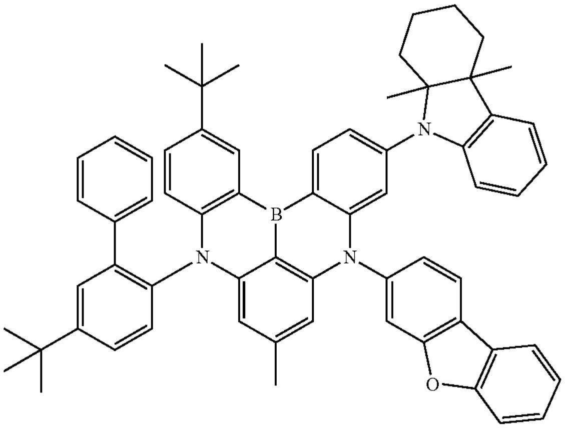
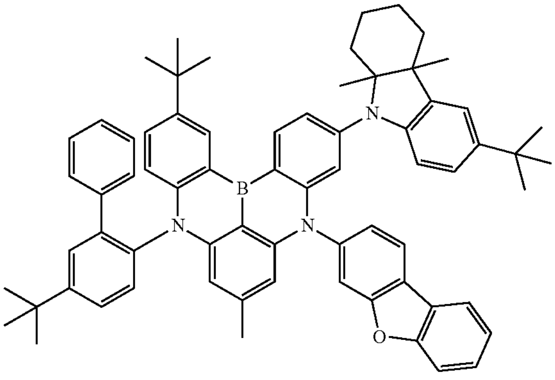
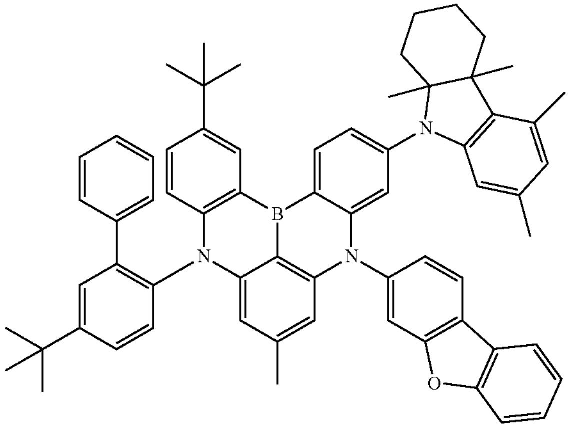
-continued
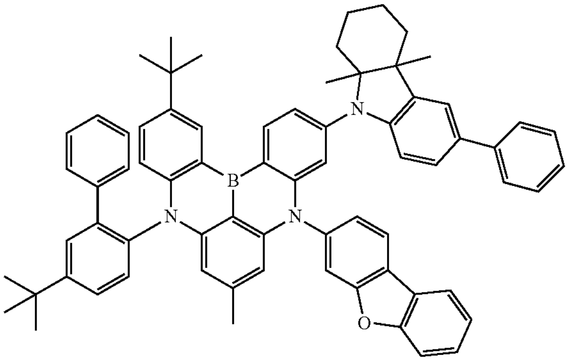
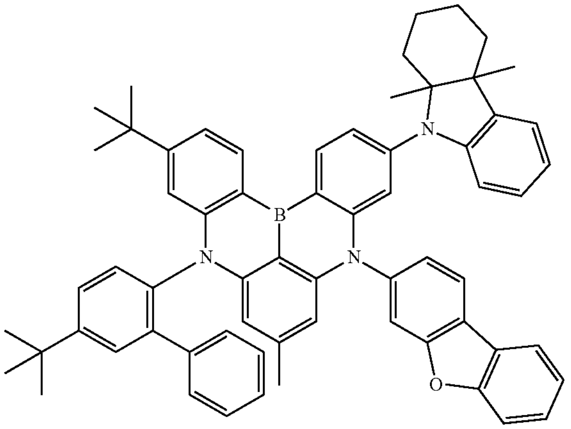
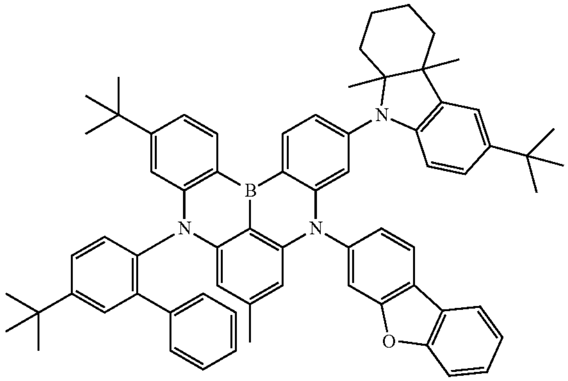
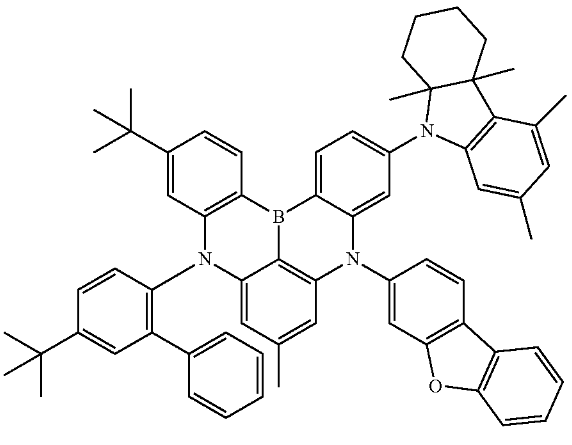

-continued
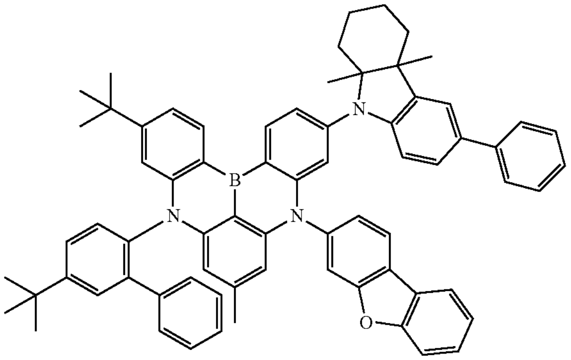
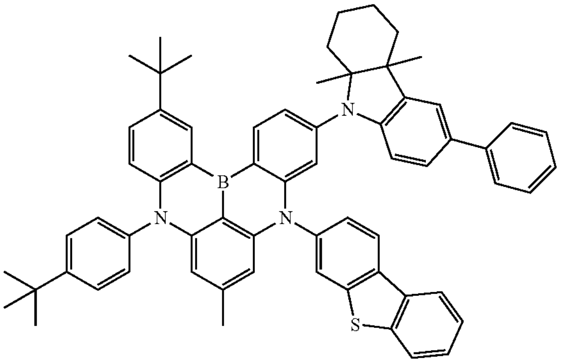
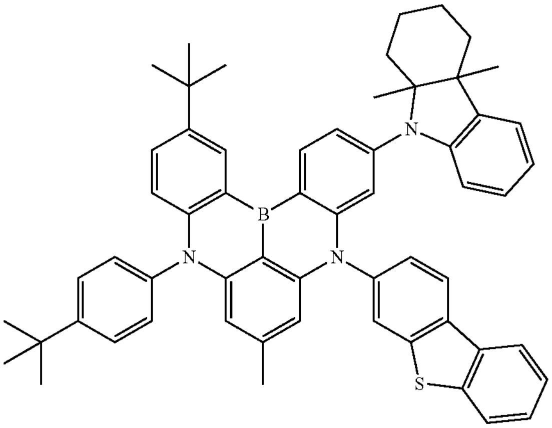
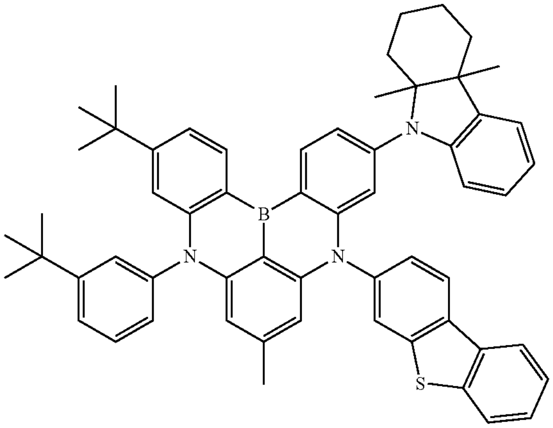
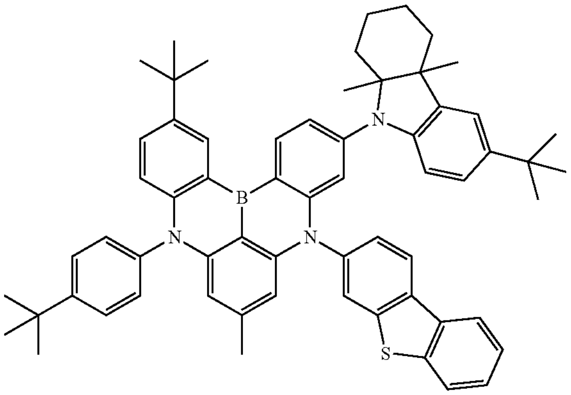
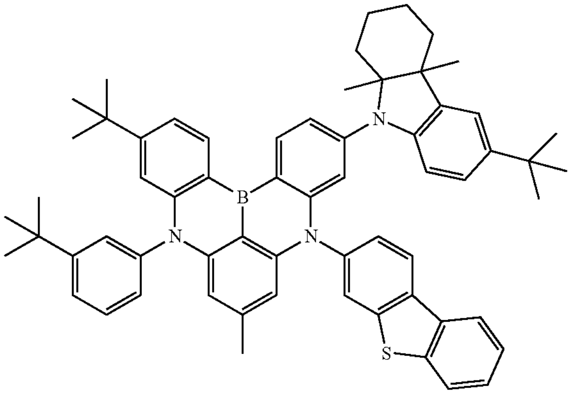
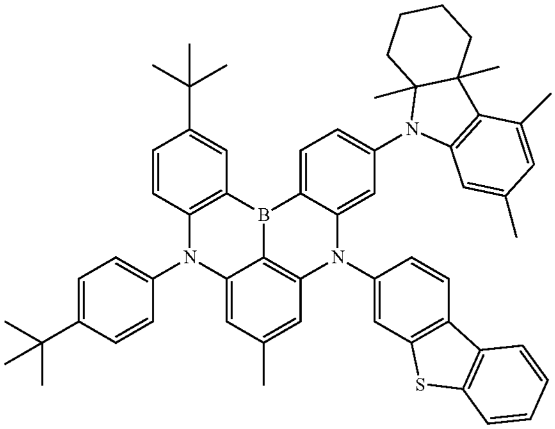
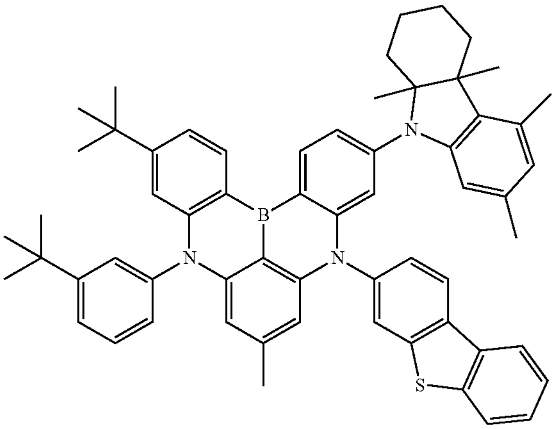
-continued -continued
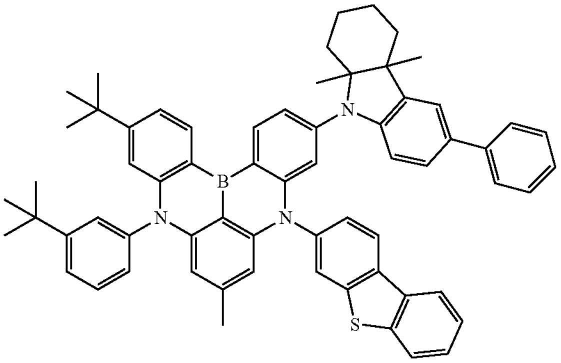
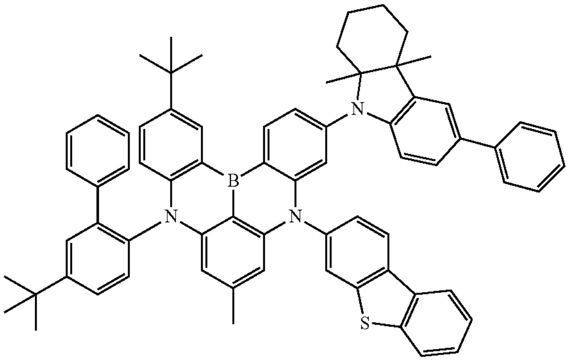
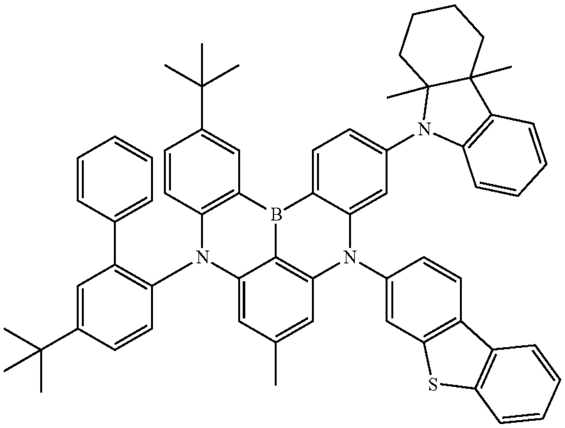
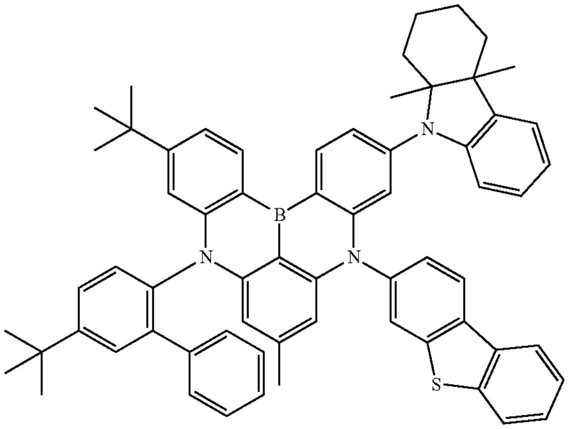
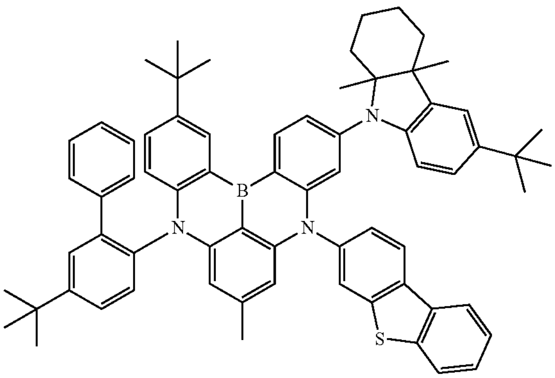
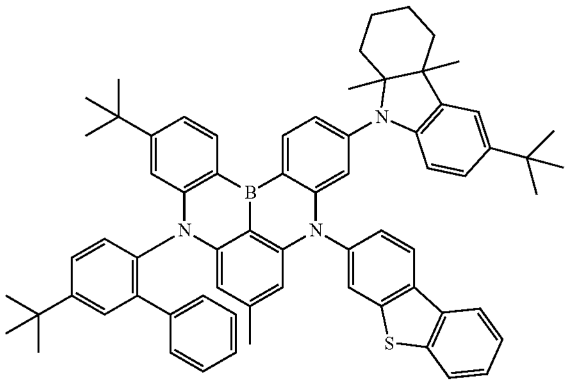
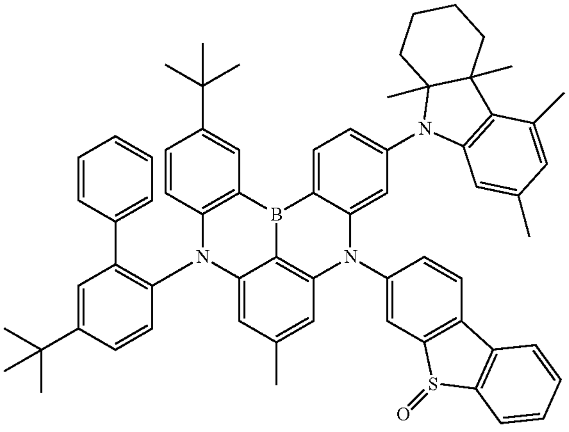
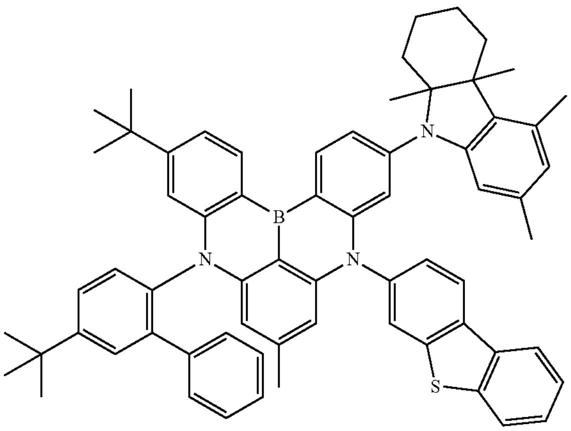
-continued -continued
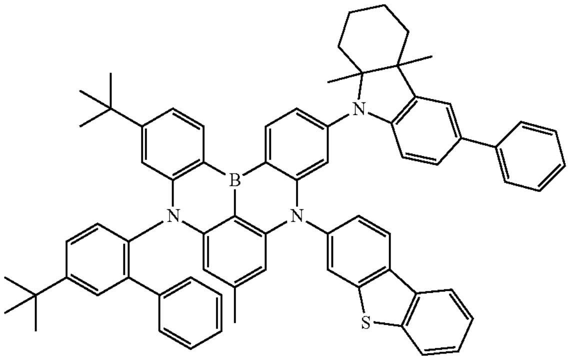
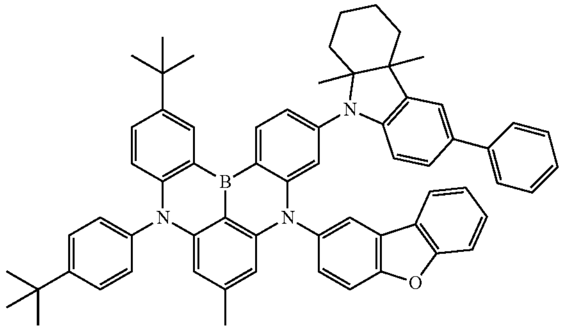
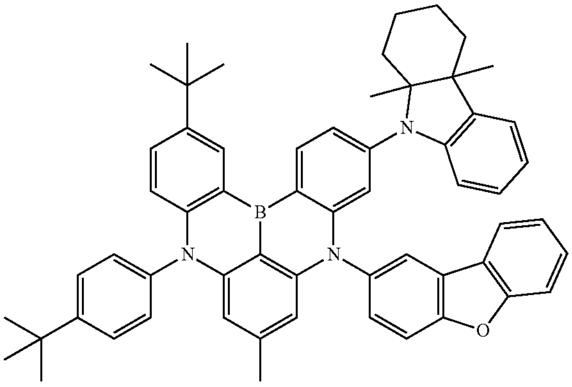
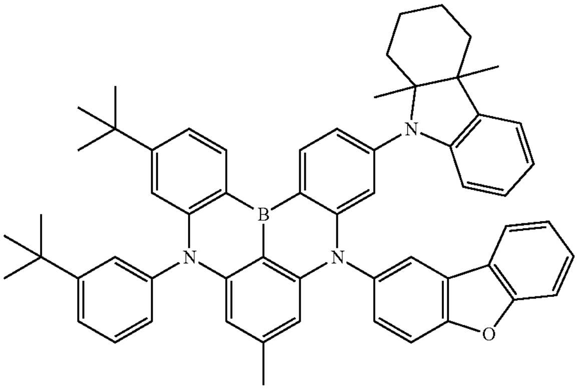
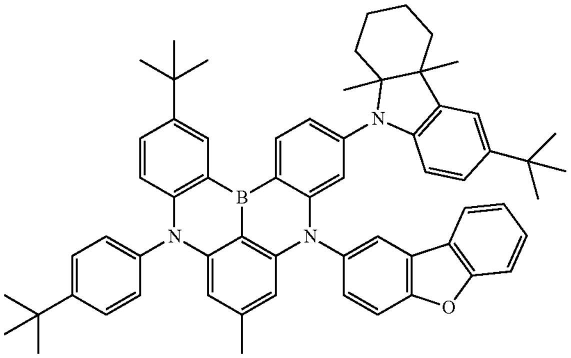
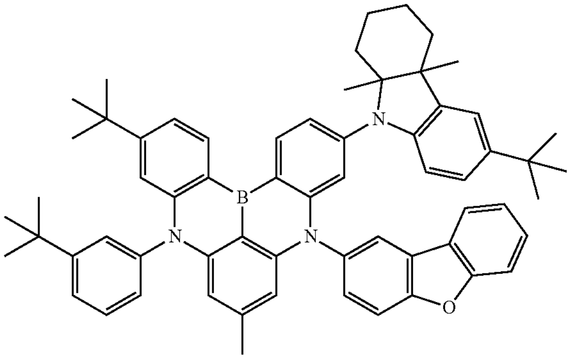
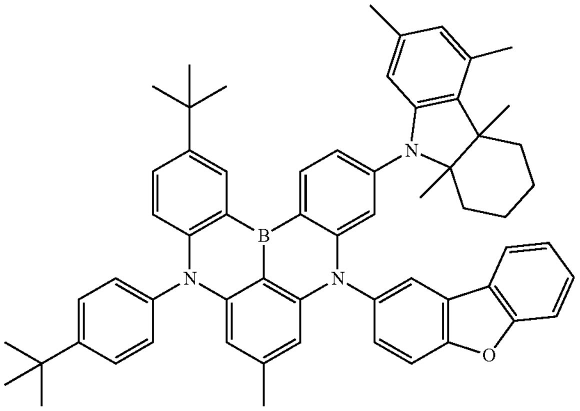
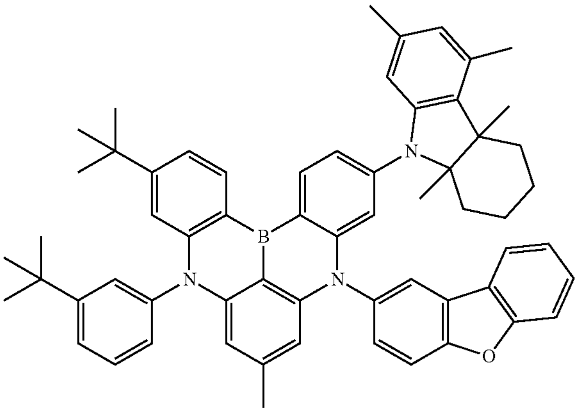
-continued -continued
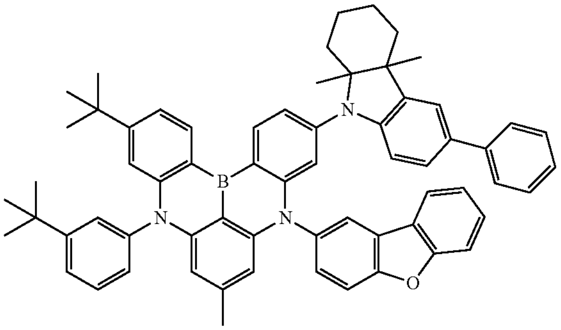
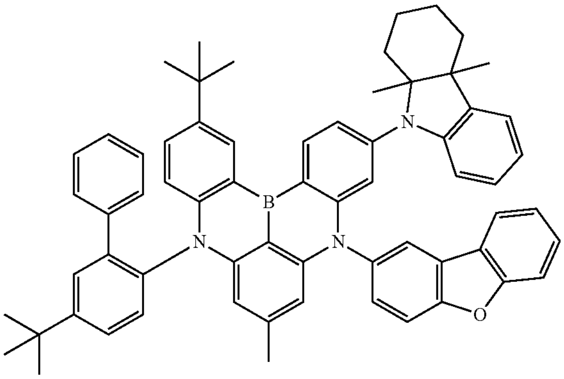
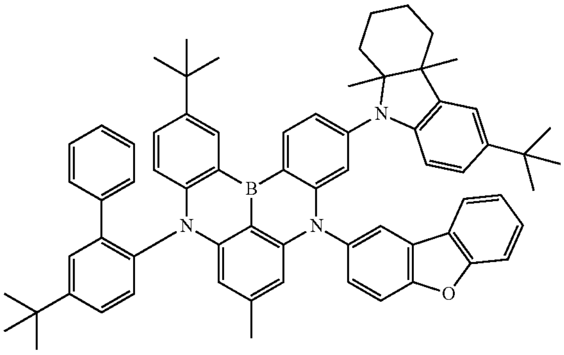
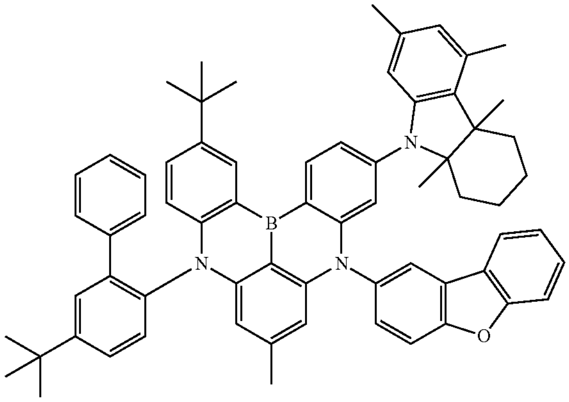
-continued
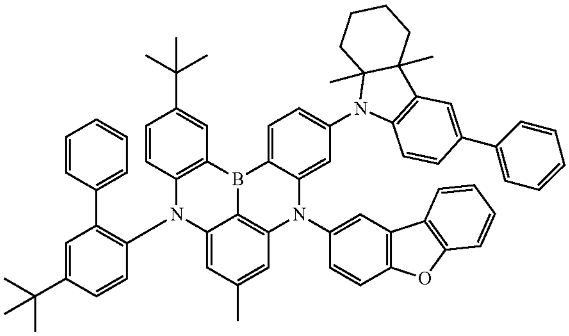
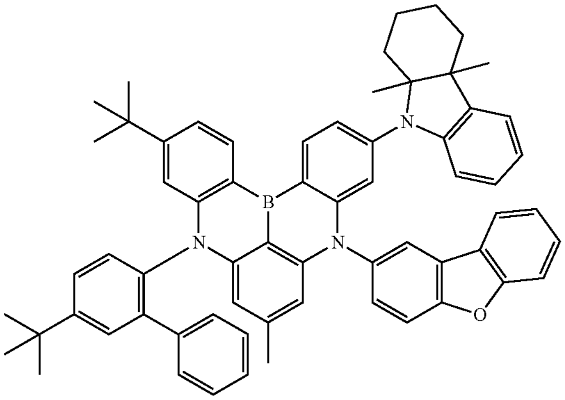
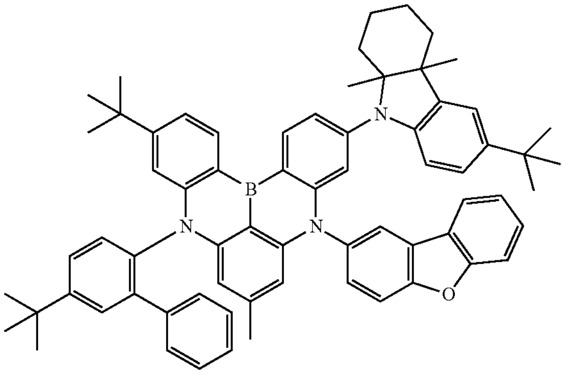
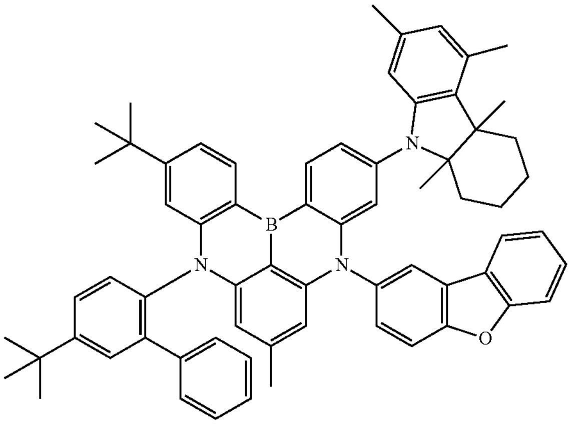

-continued
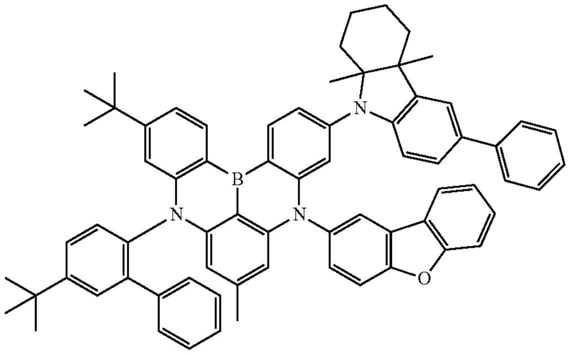
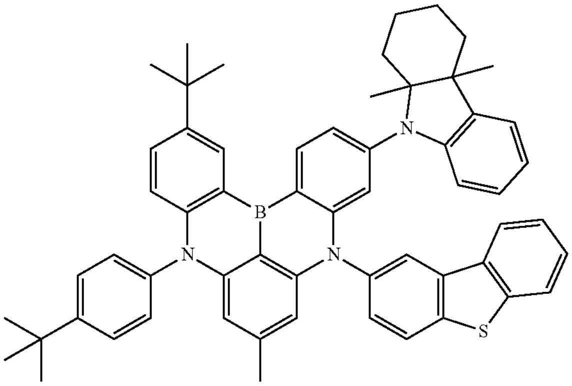
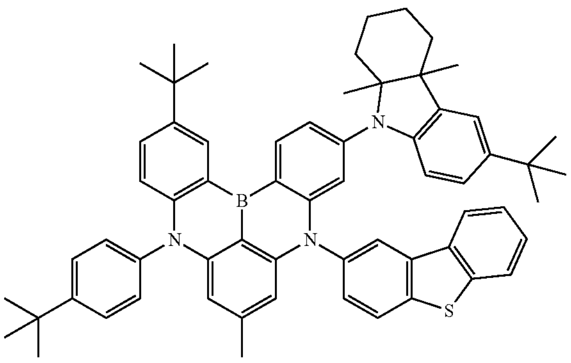
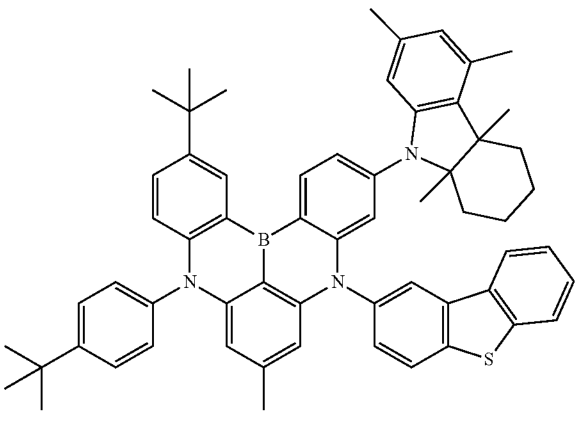
-continued
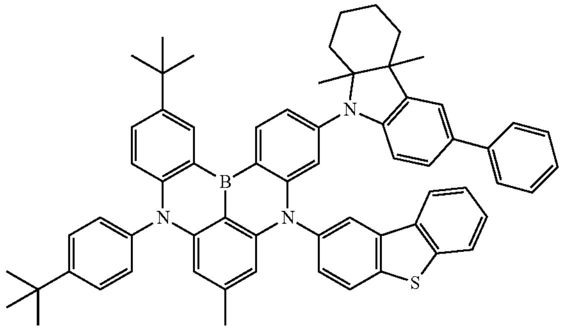
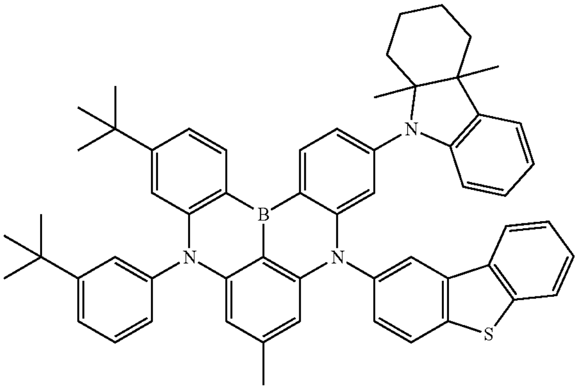
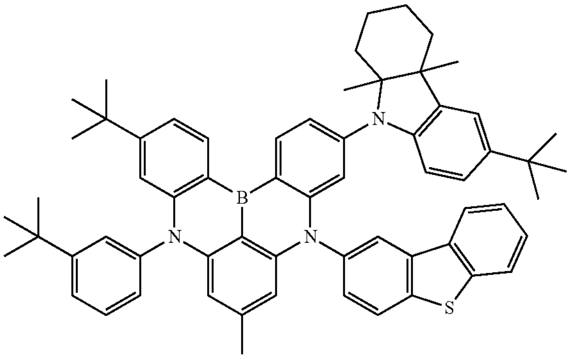
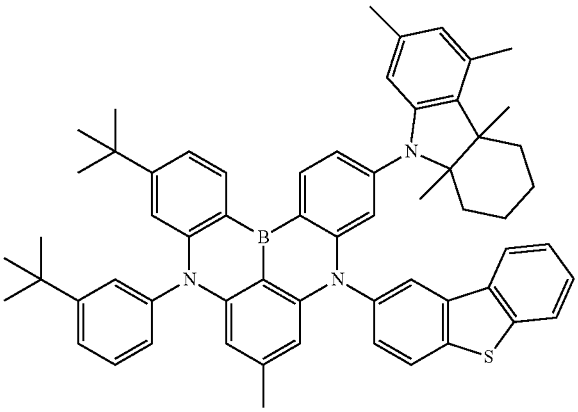

-continued
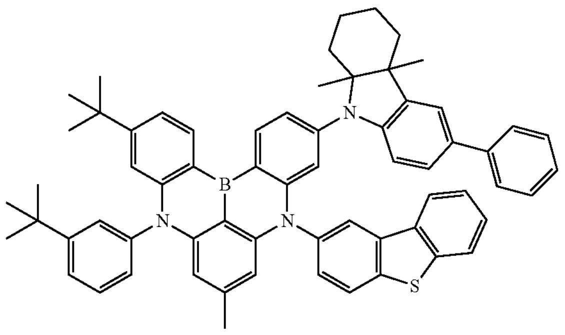
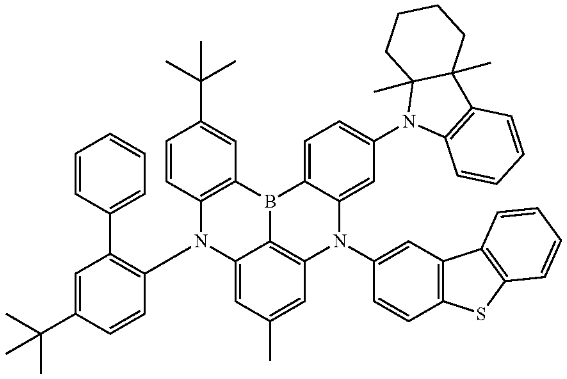
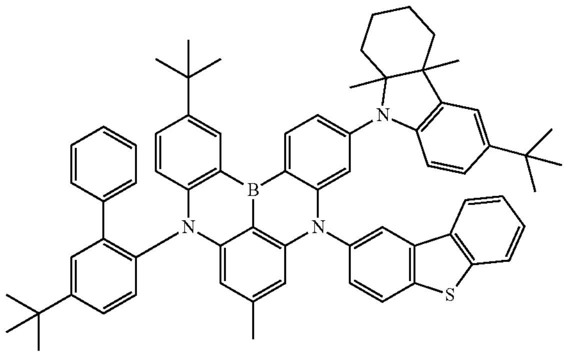
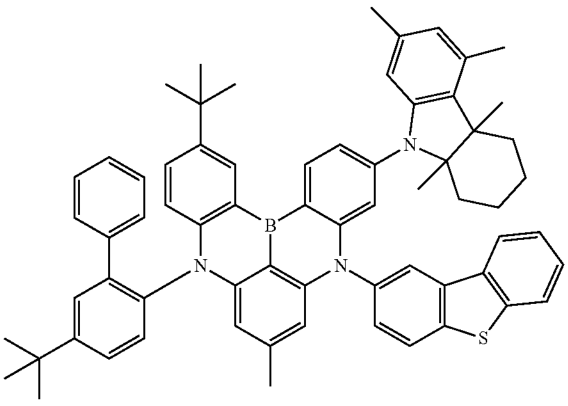
-continued
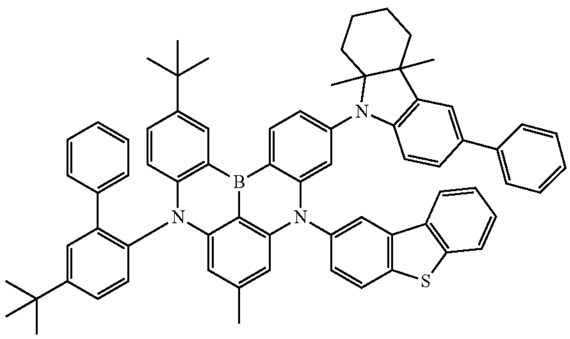
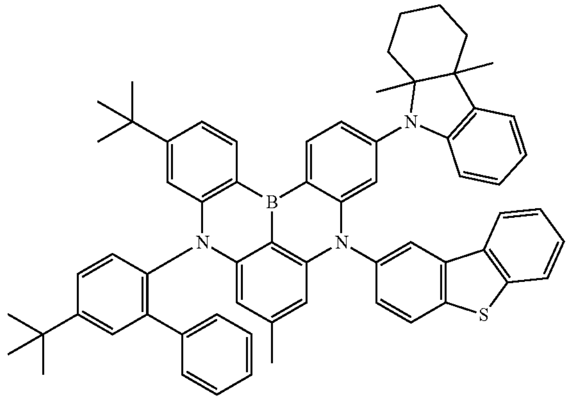
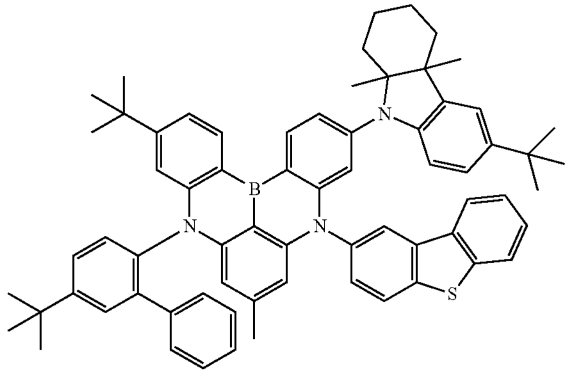
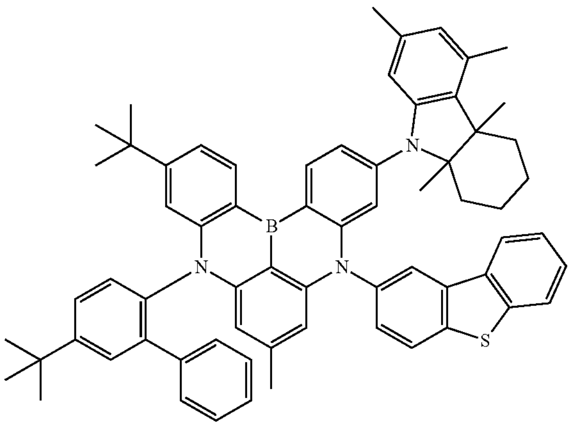

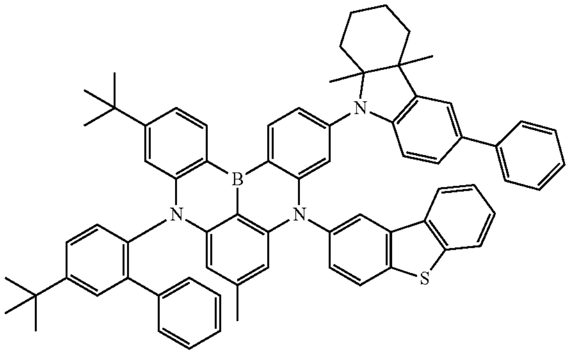
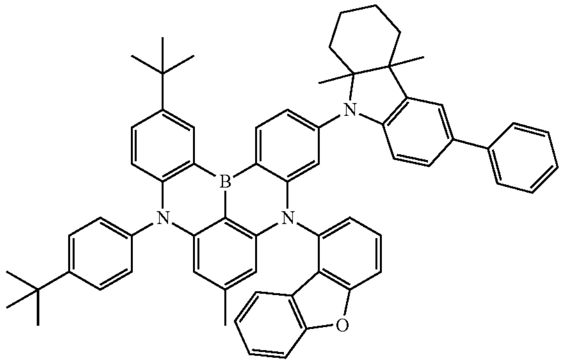
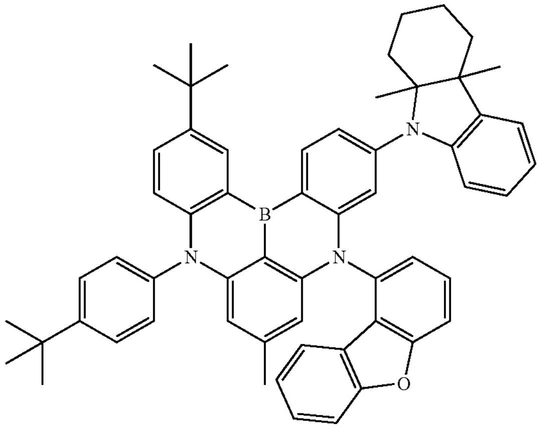
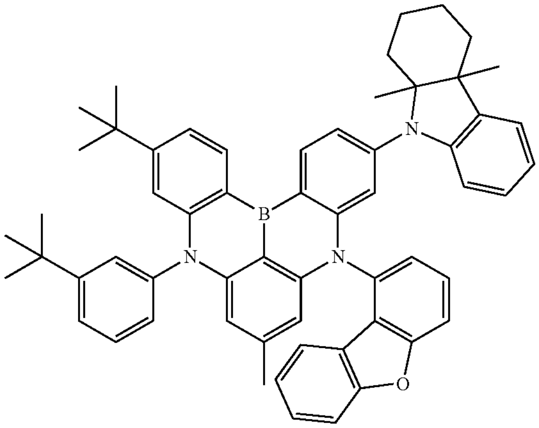
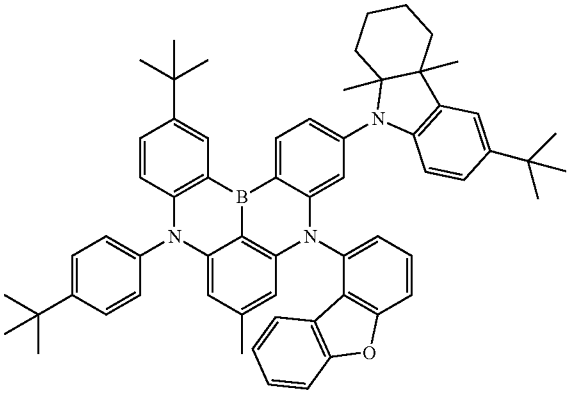
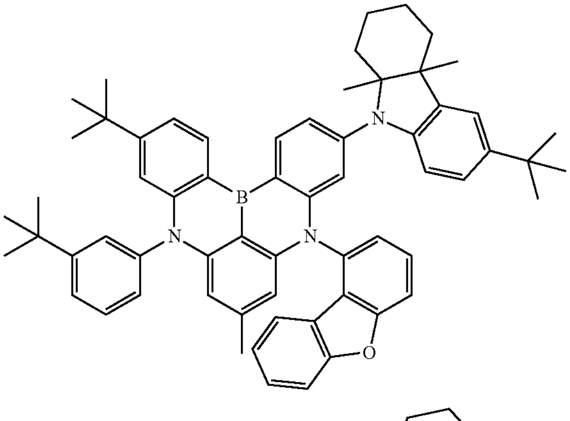
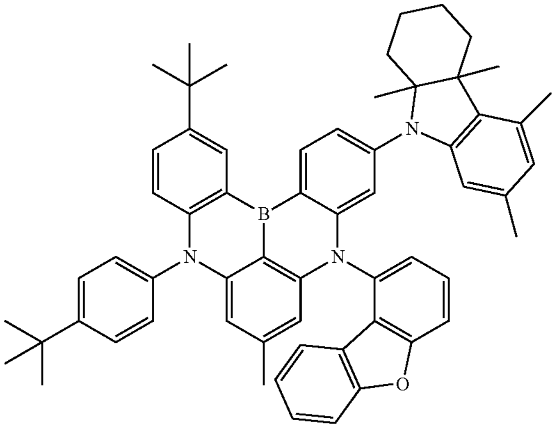
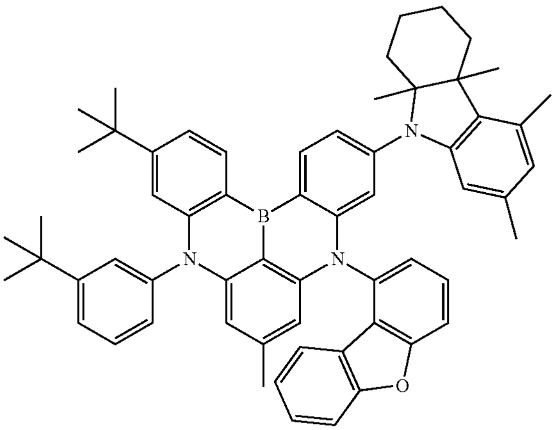

-continued
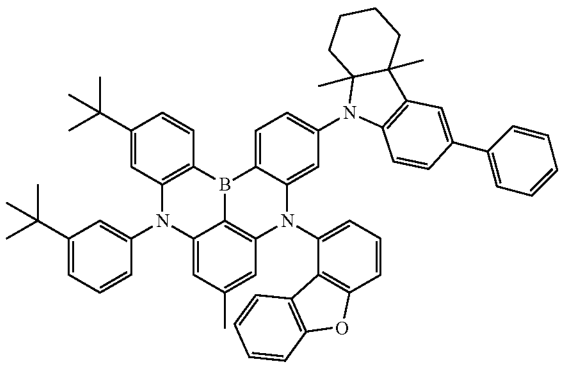
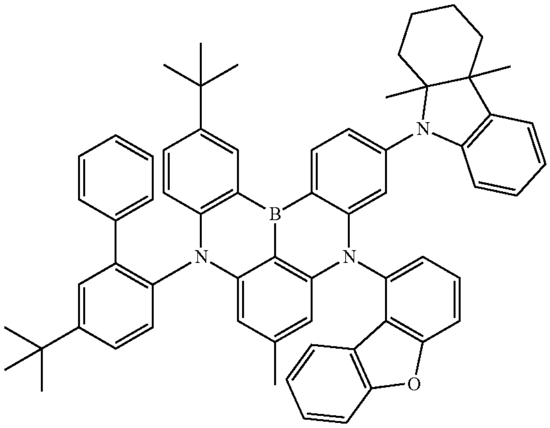
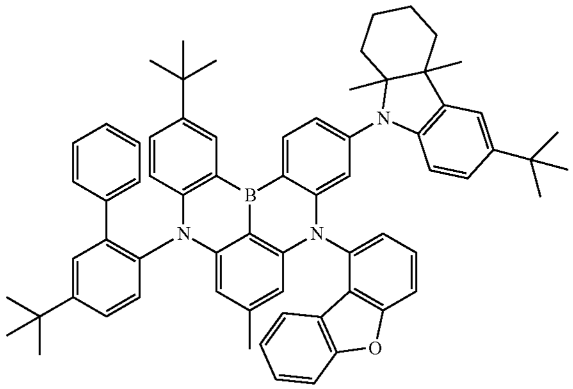
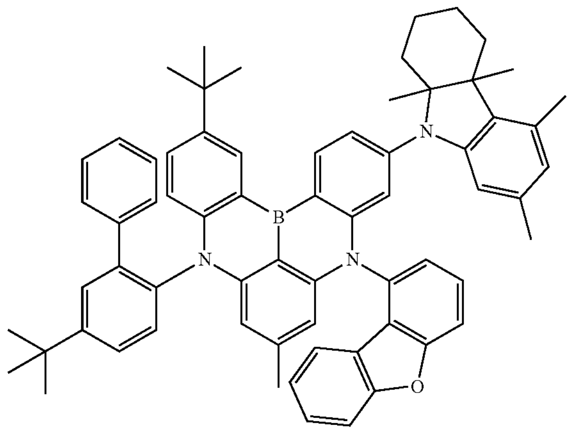
-continued
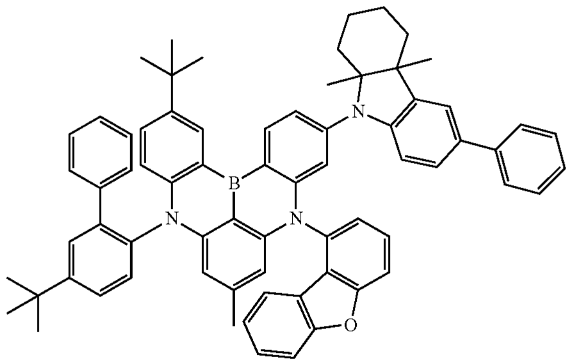
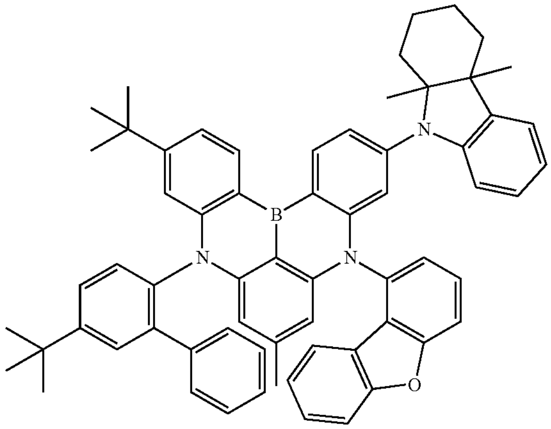
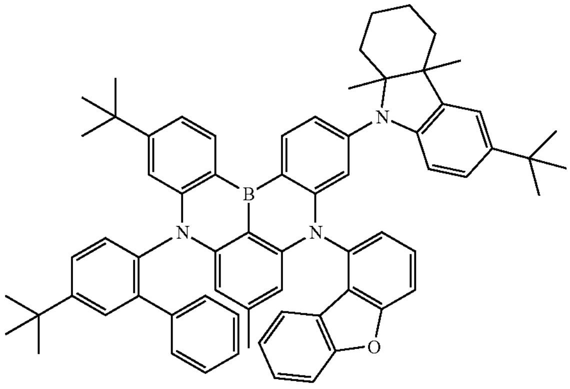
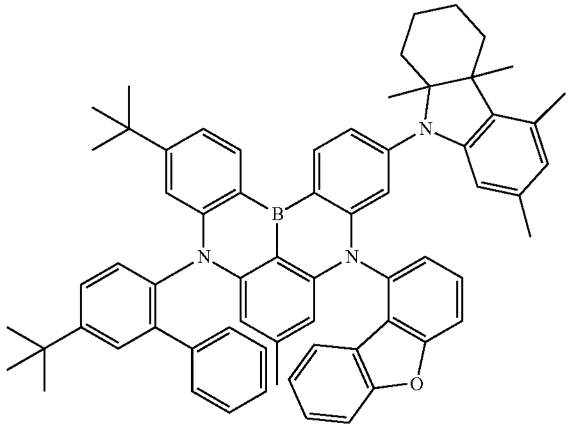

-continued
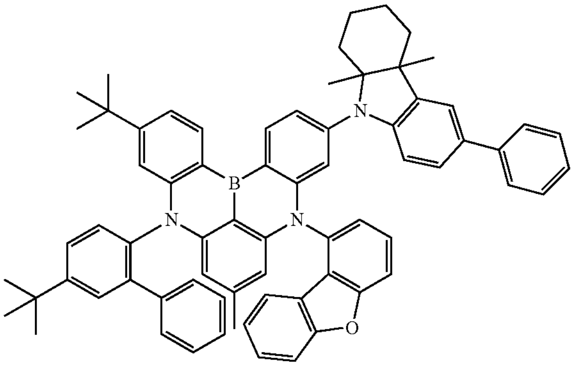
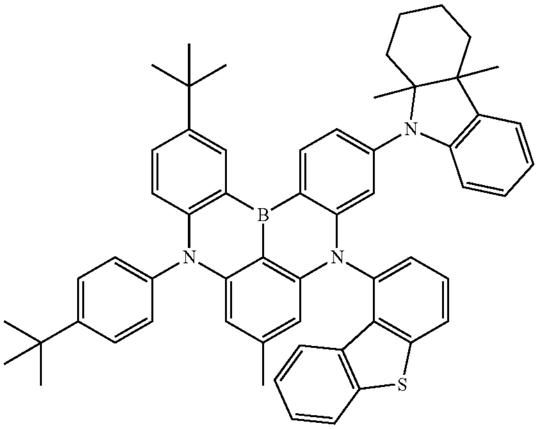
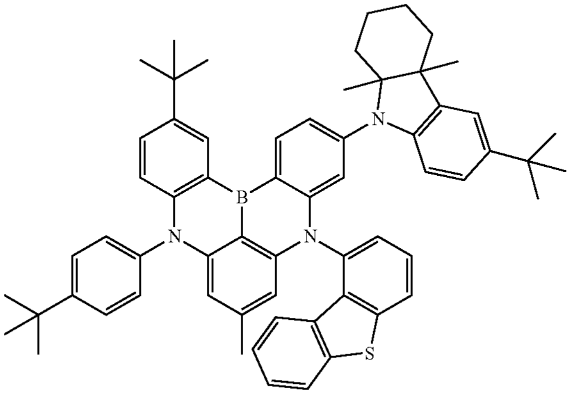
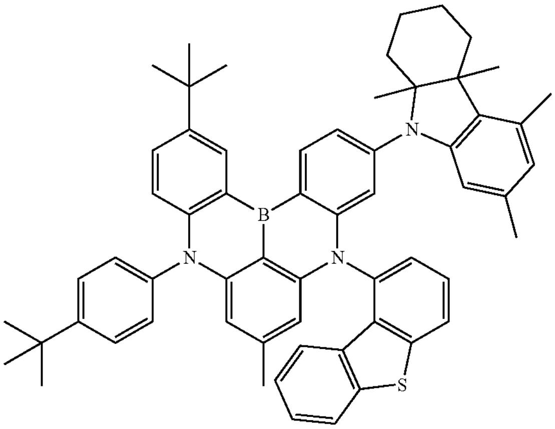
-continued
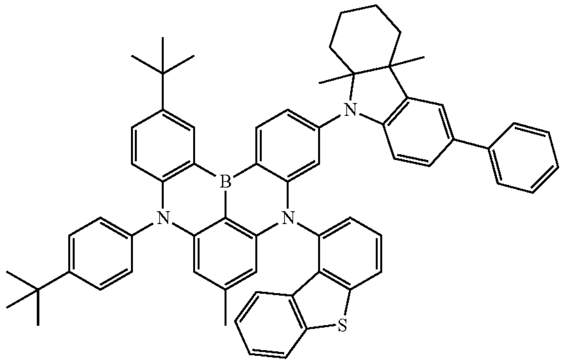
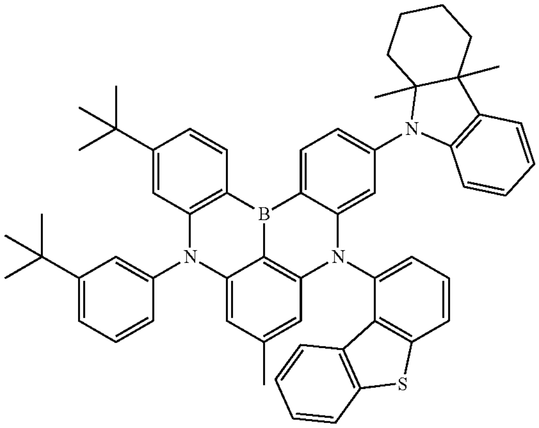
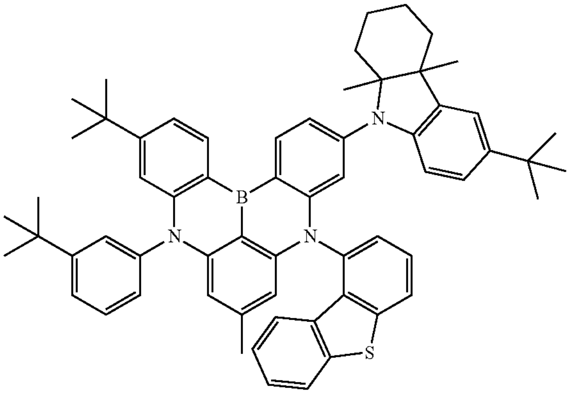
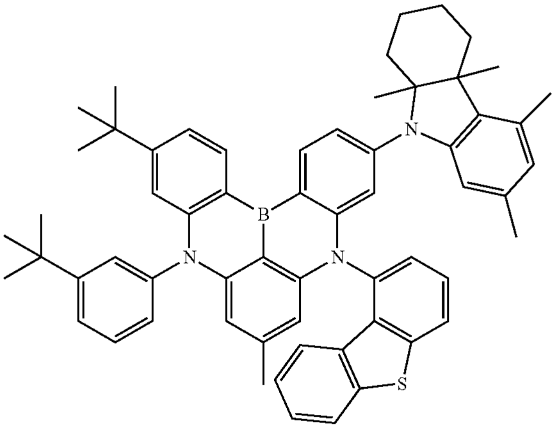

-continued
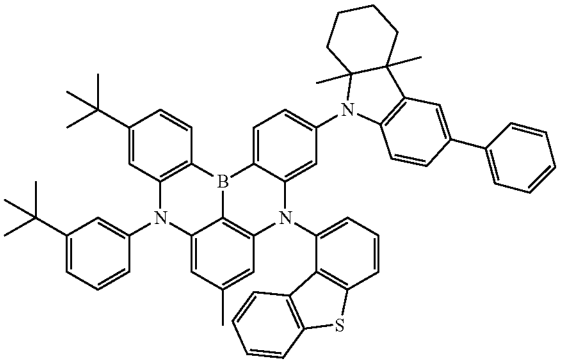
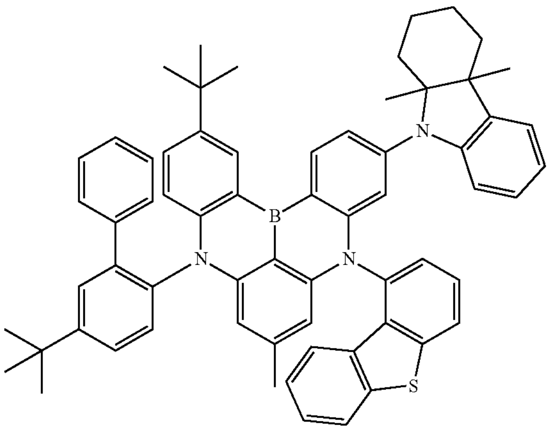
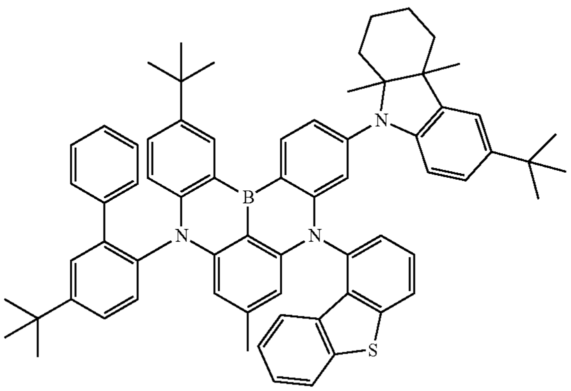
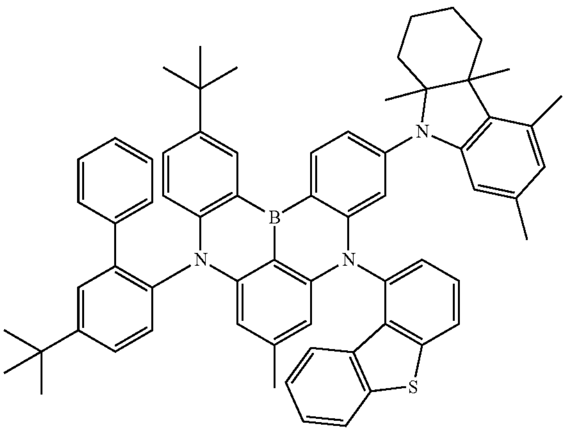
-continued
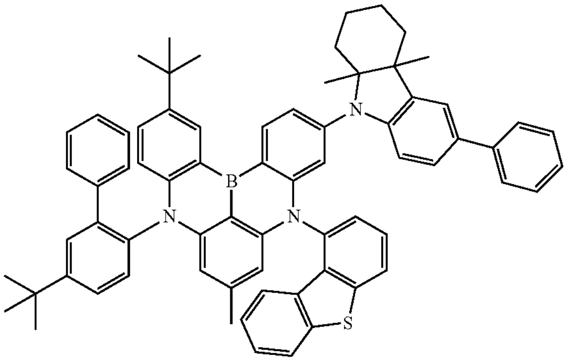
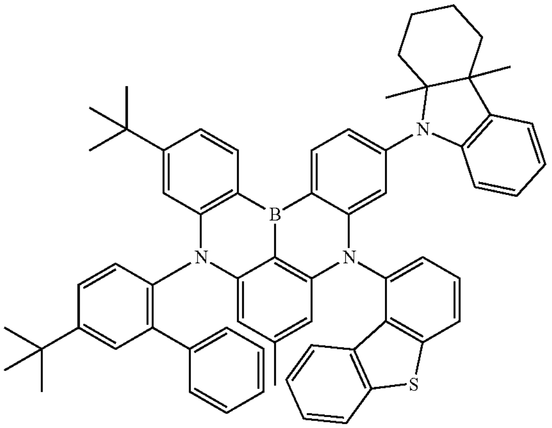
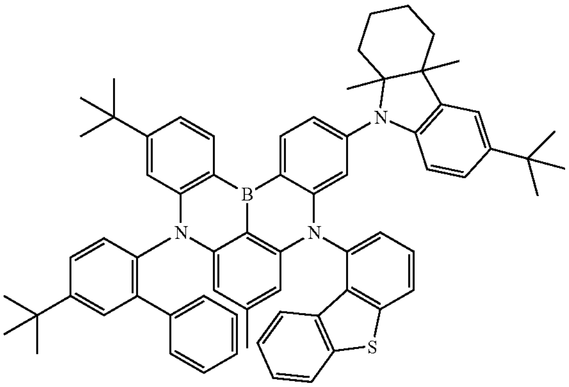
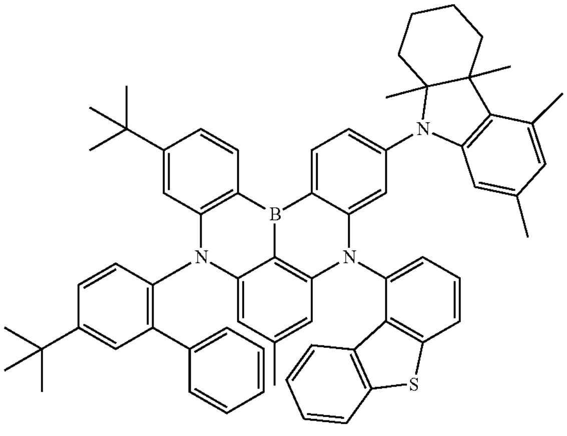

-continued
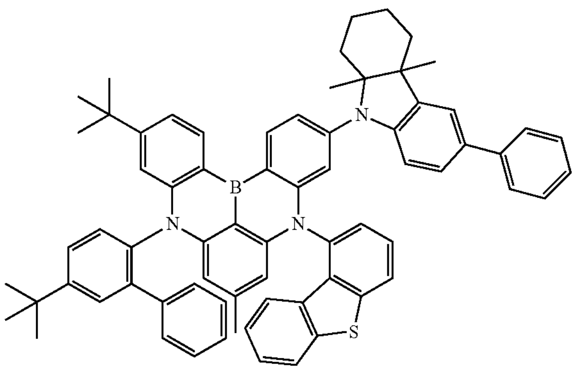
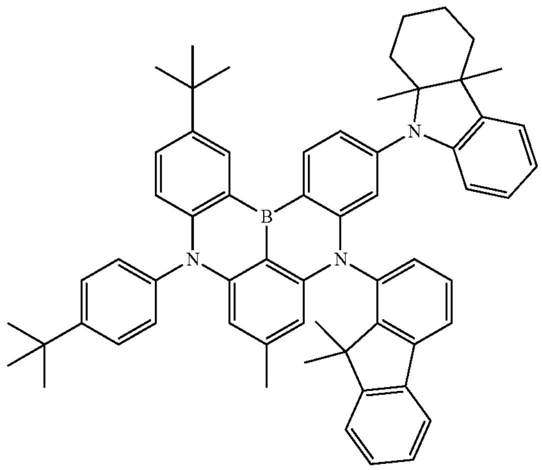
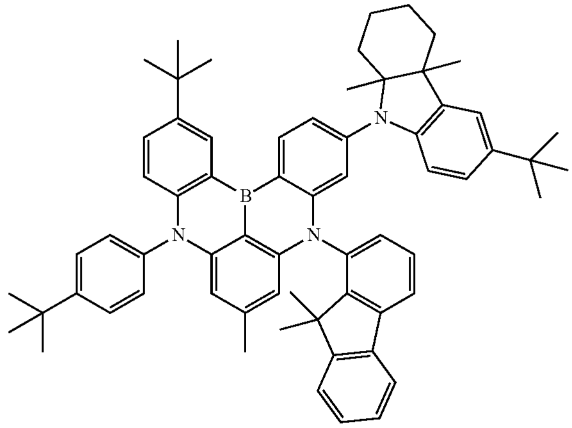
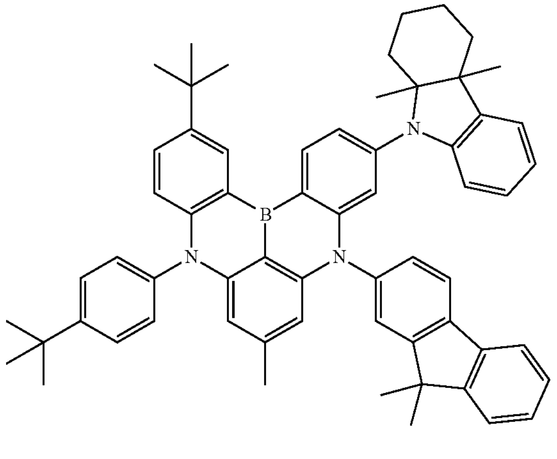
-continued
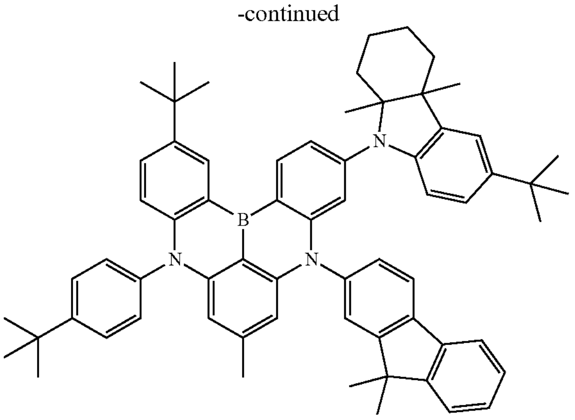
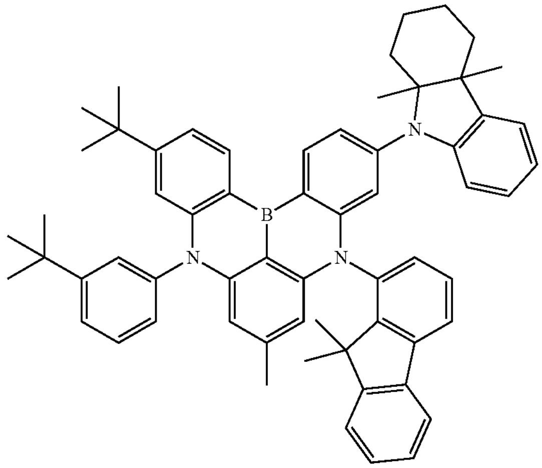
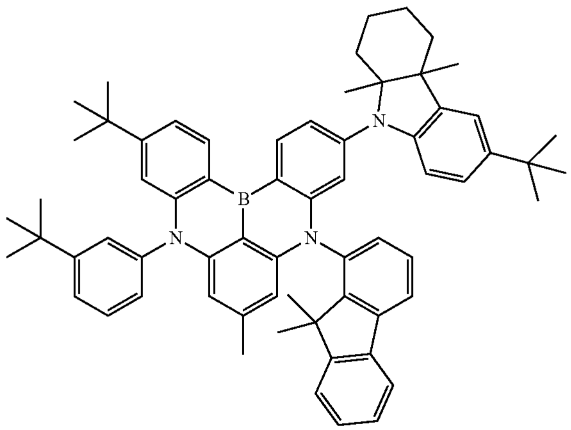
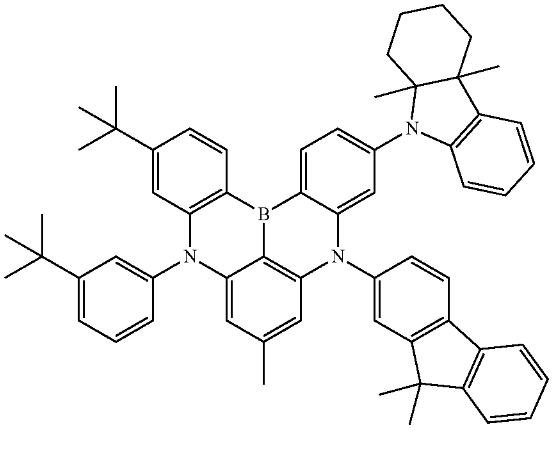

-continued
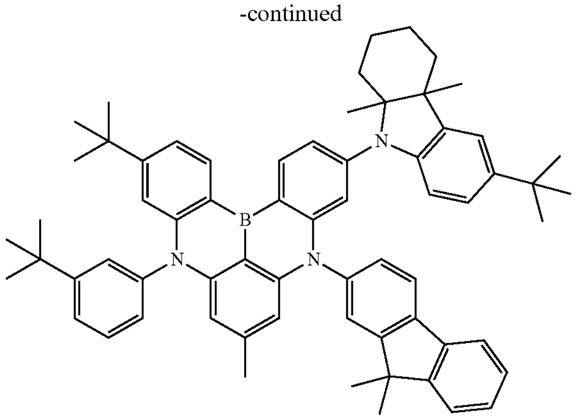
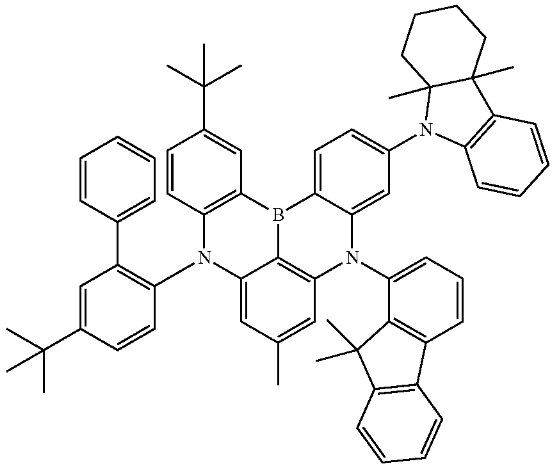
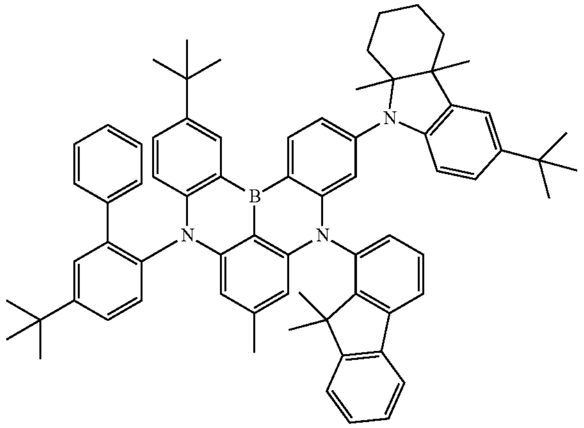
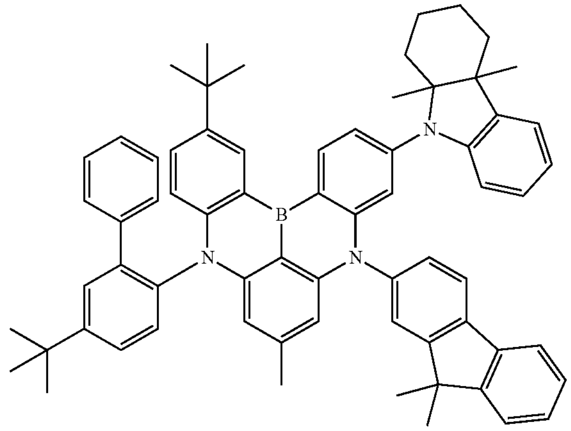
-continued
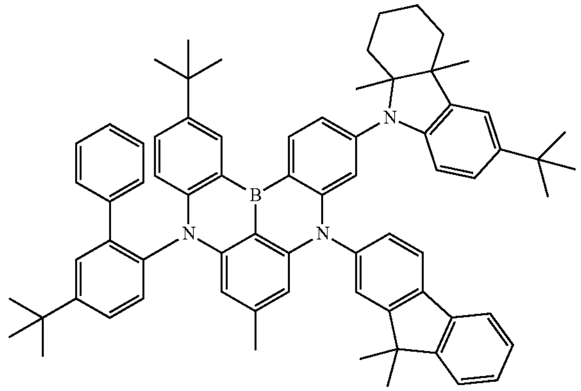
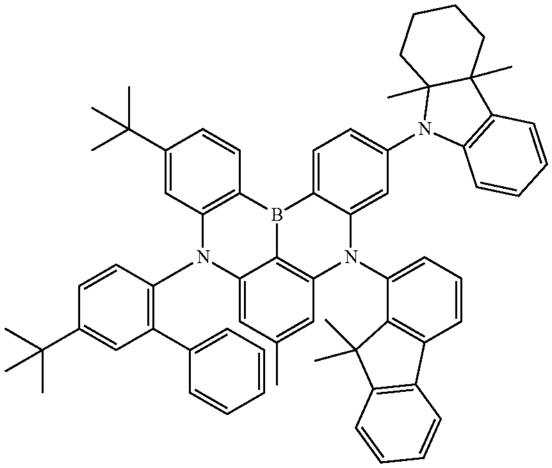
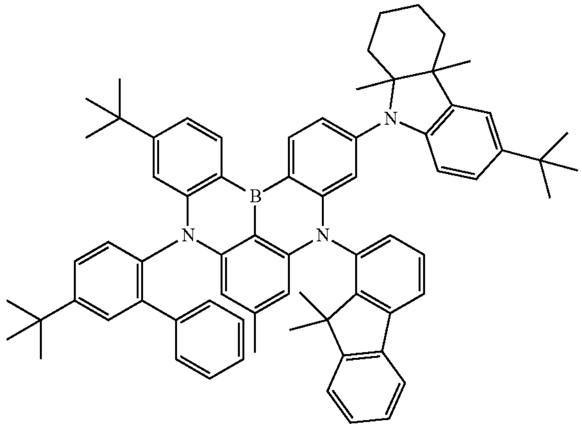
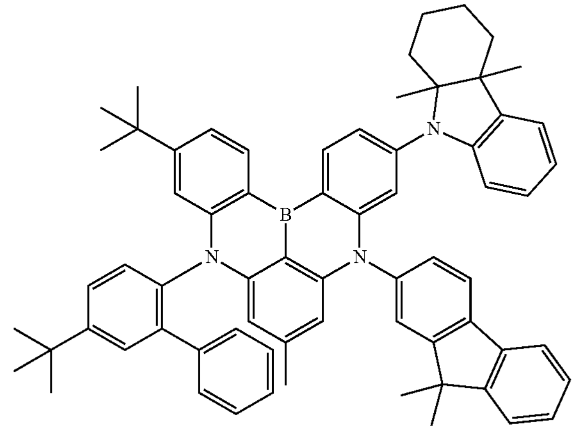

-continued
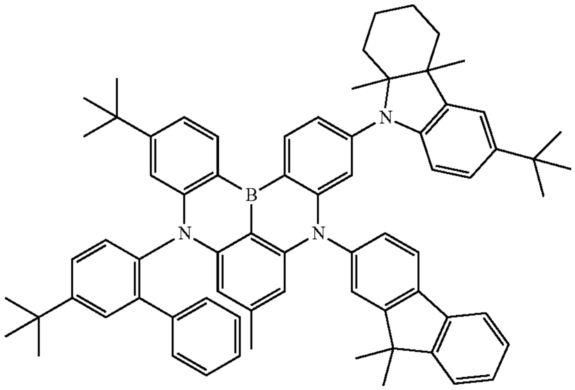
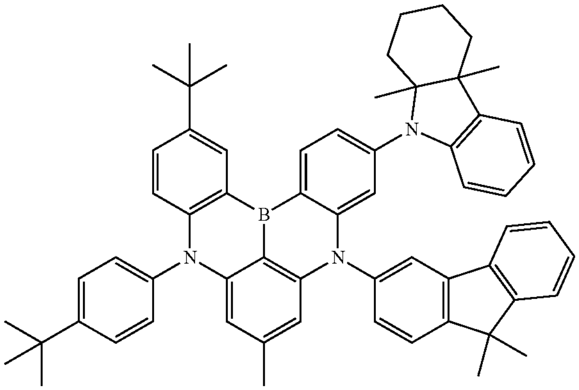
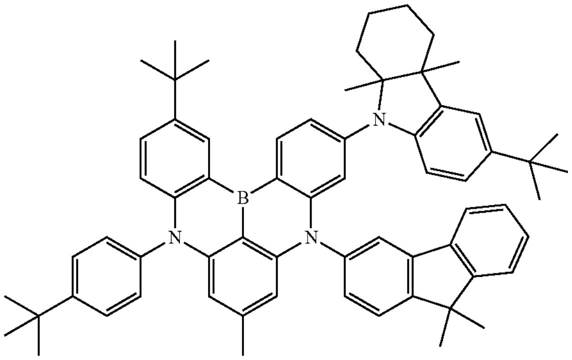
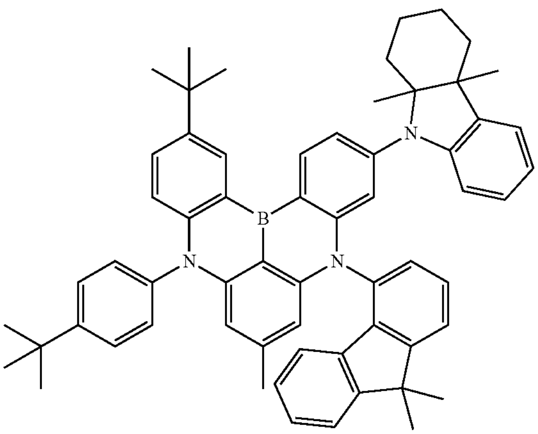
-continued
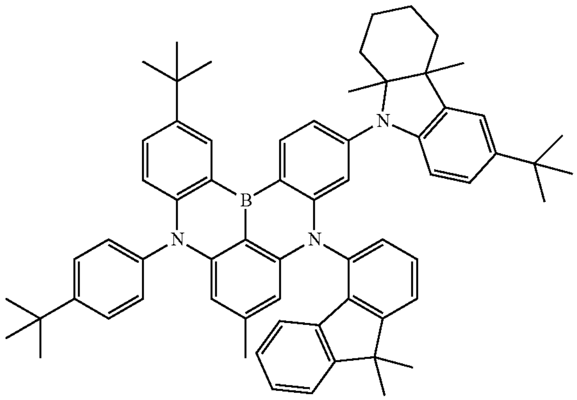
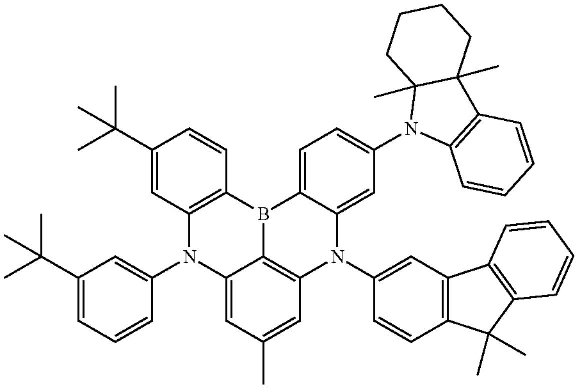
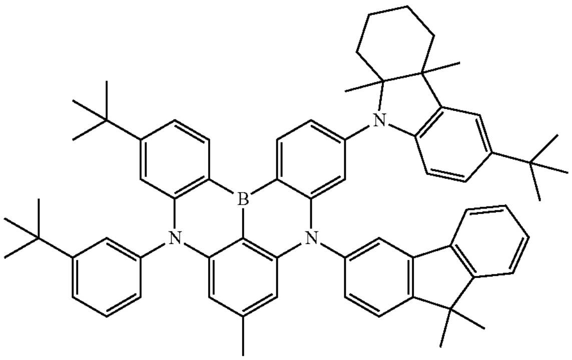
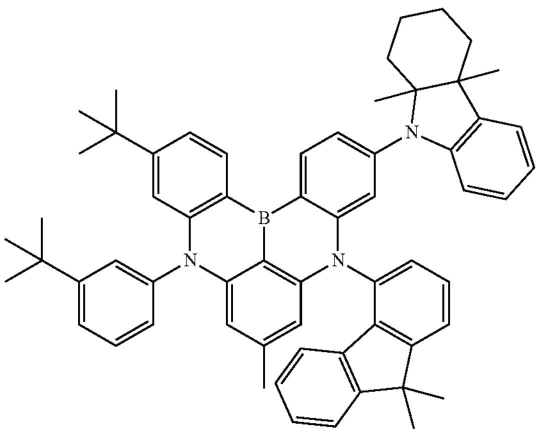

-continued
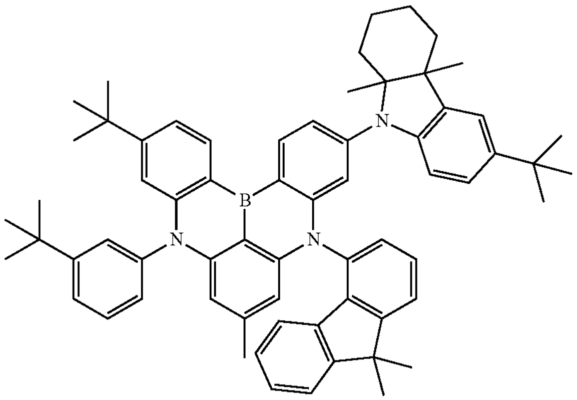
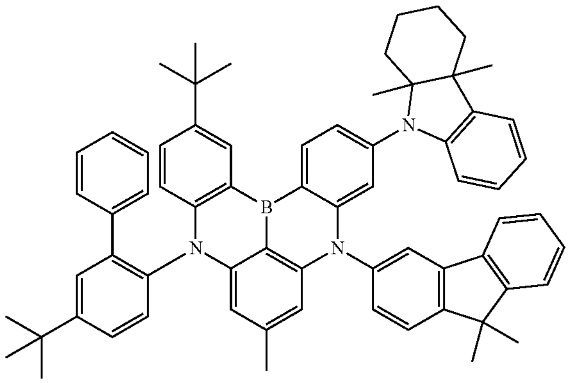
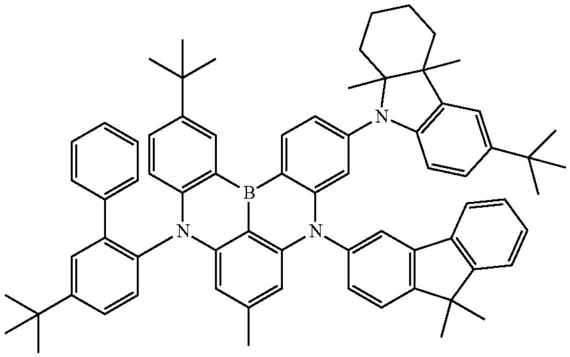
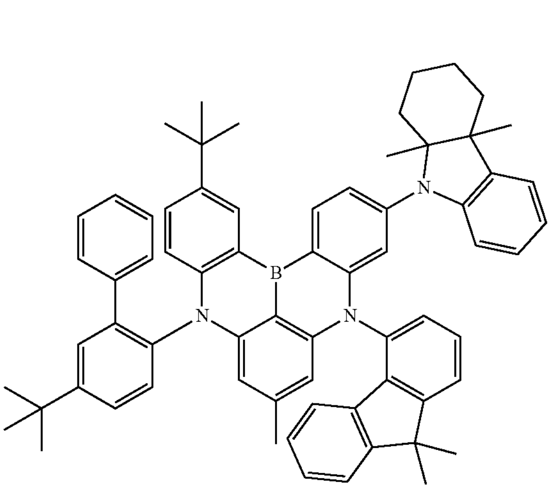
-continued
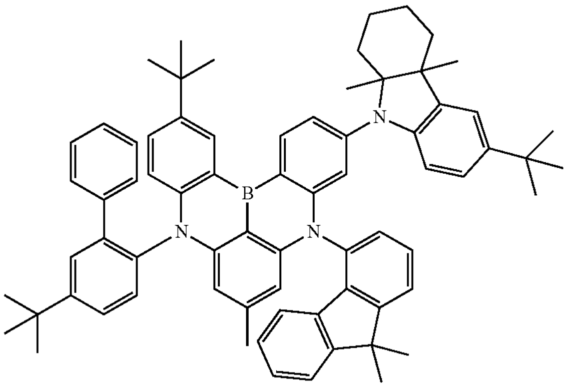
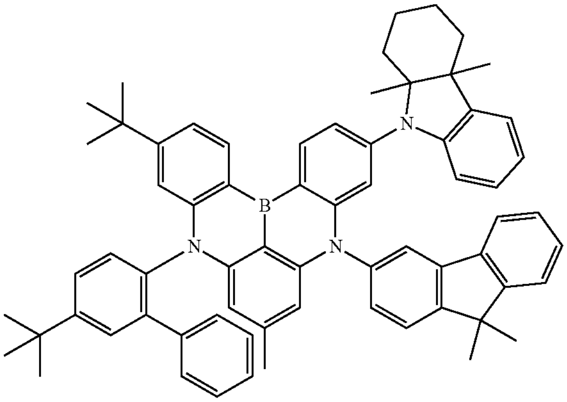
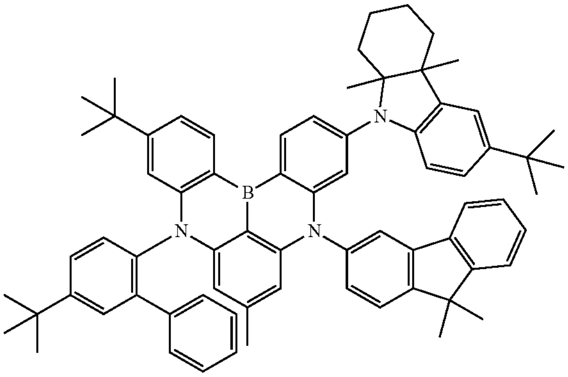
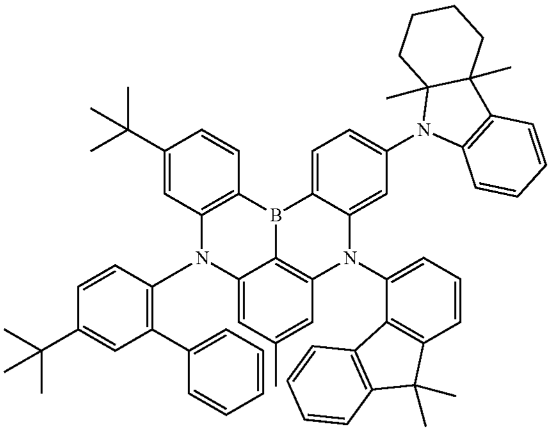

-continued
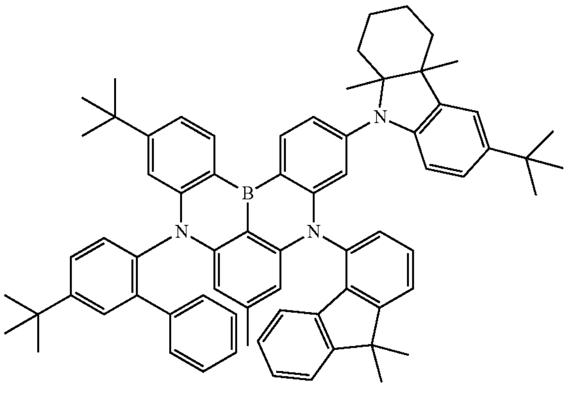
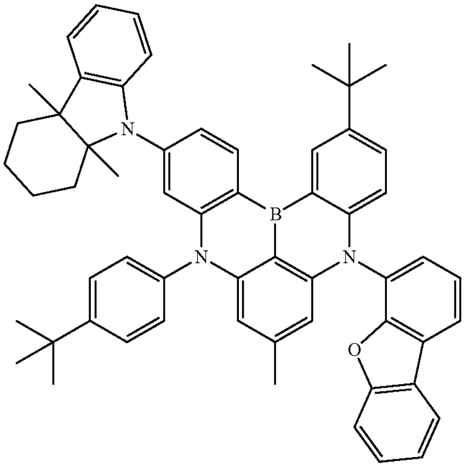
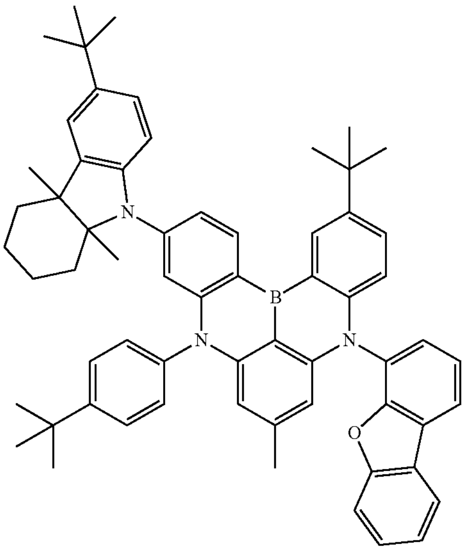
-continued
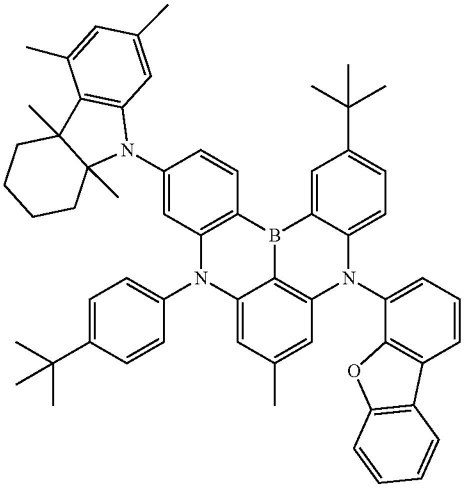
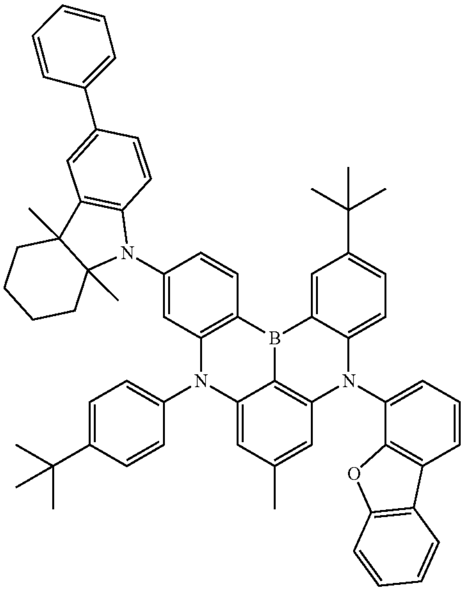
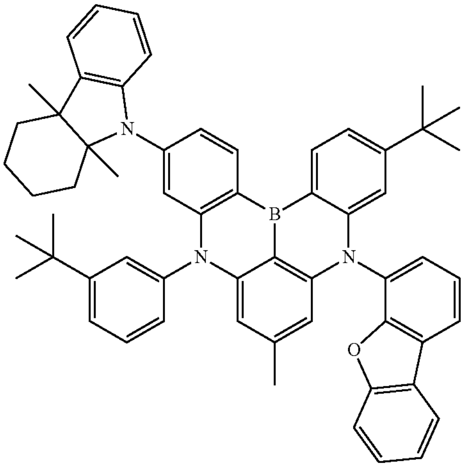

-continued
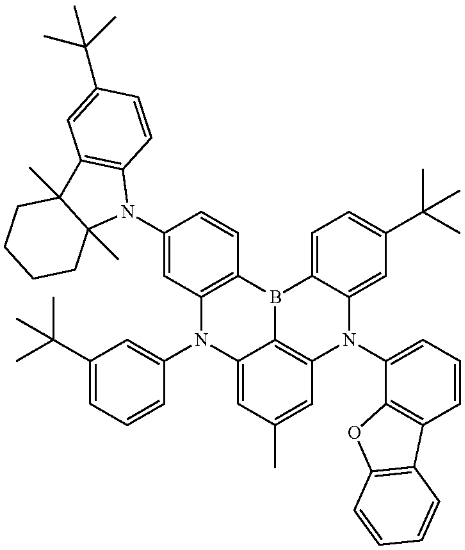
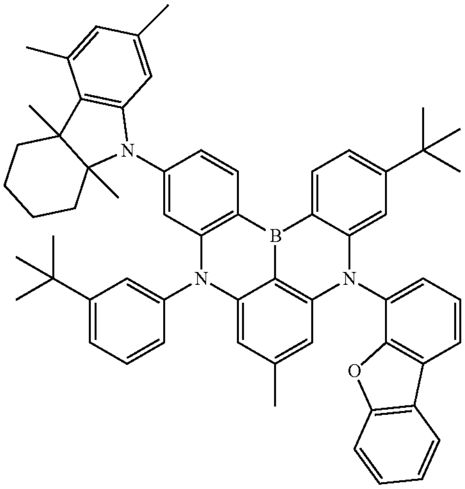
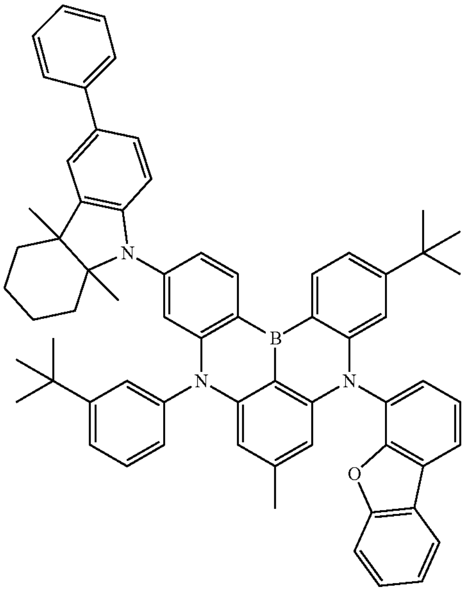
-continued
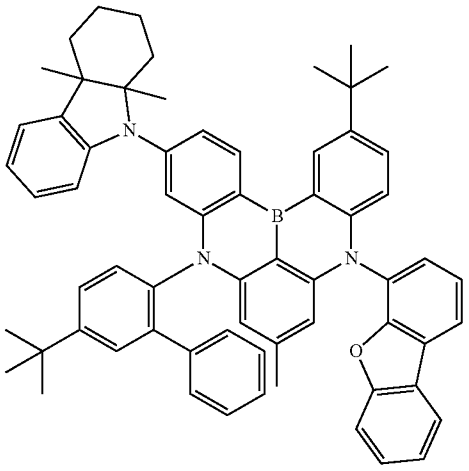
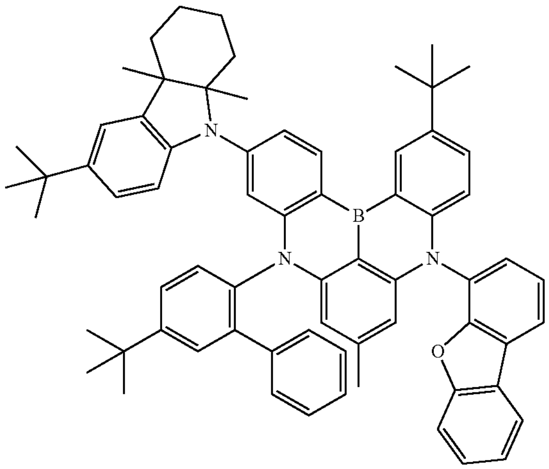
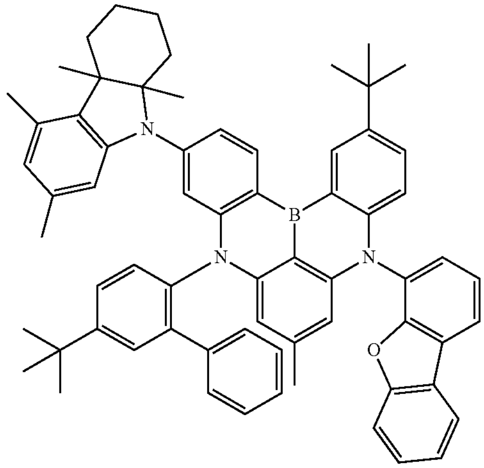

-continued
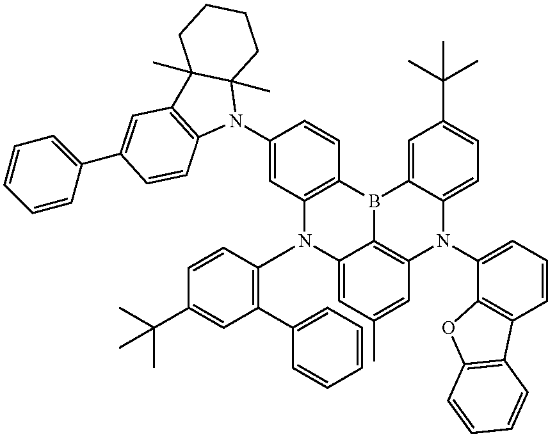
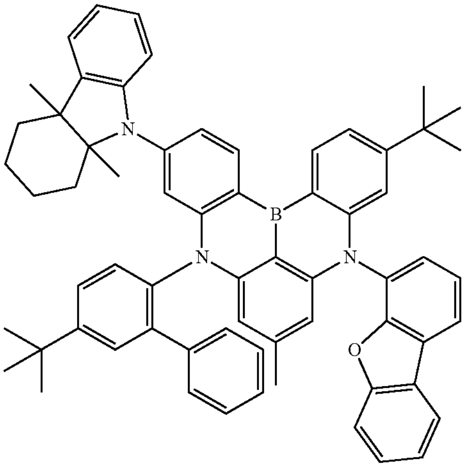
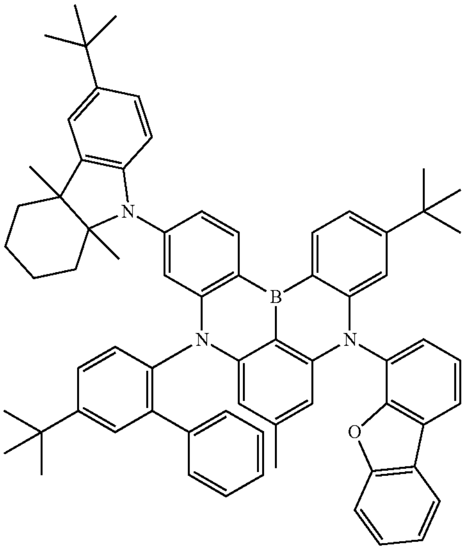
-continued
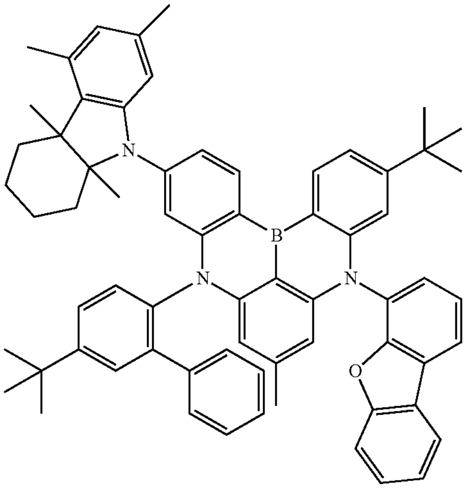
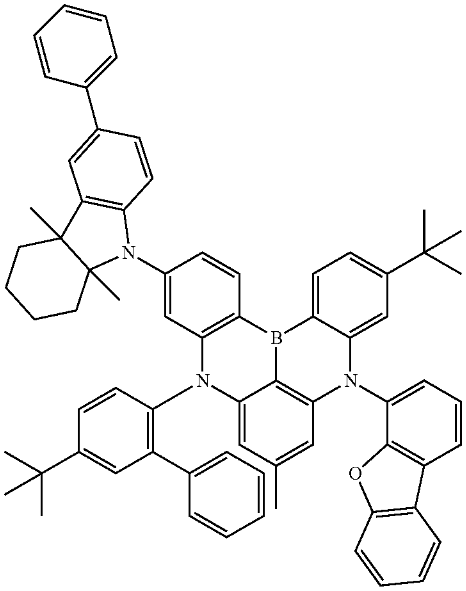
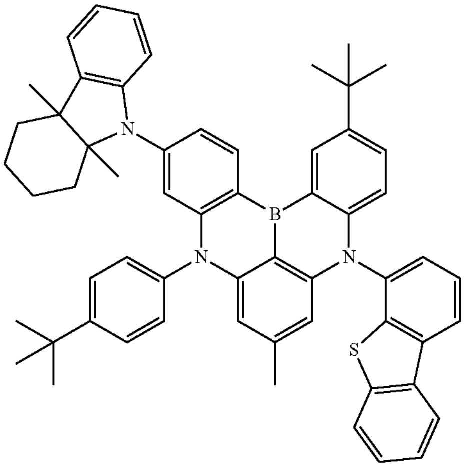

-continued
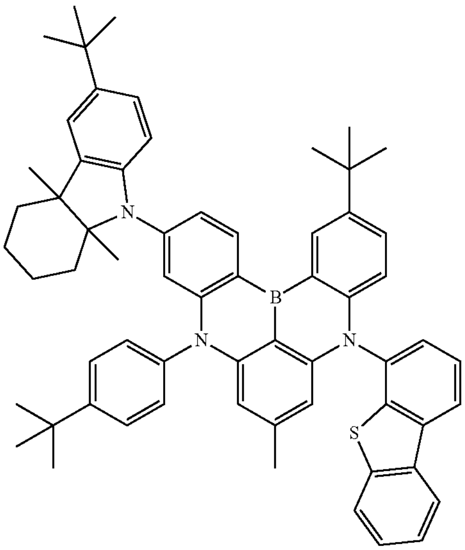
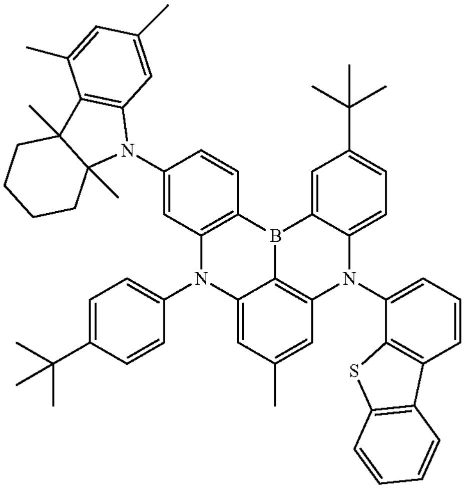
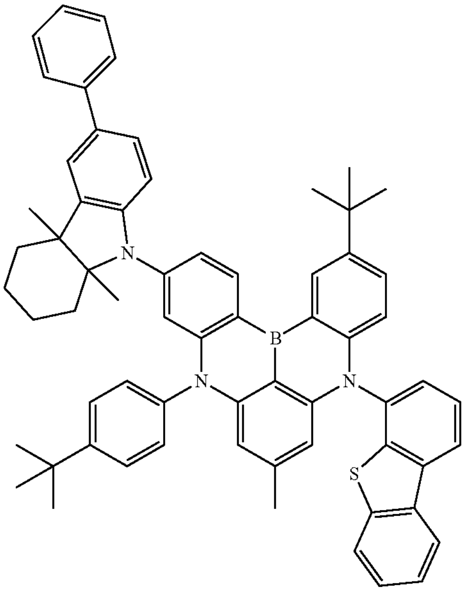
-continued
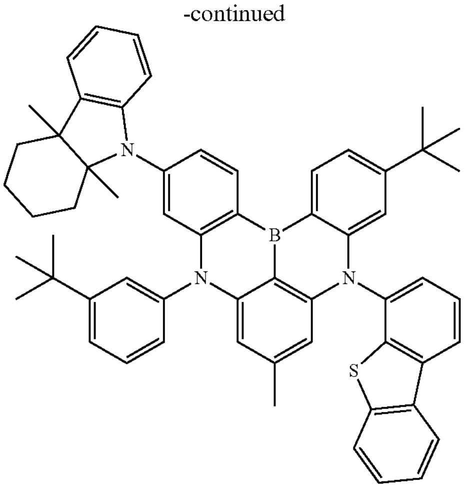
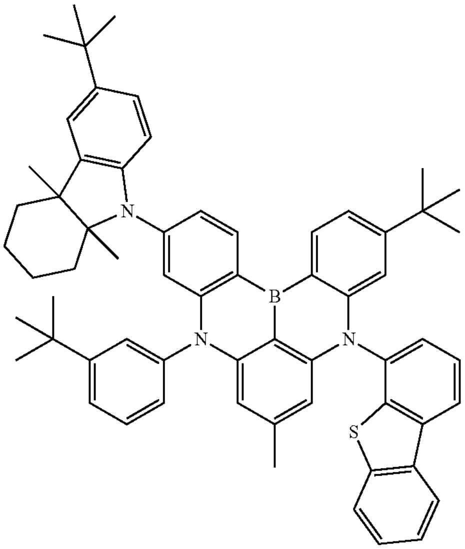
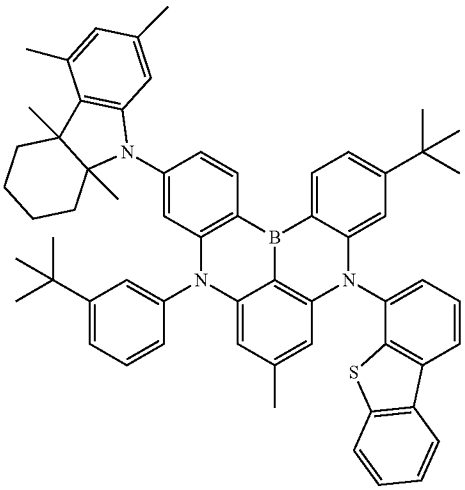

-continued
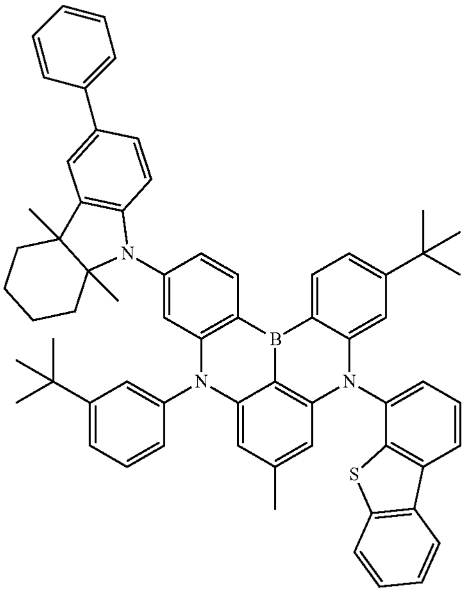
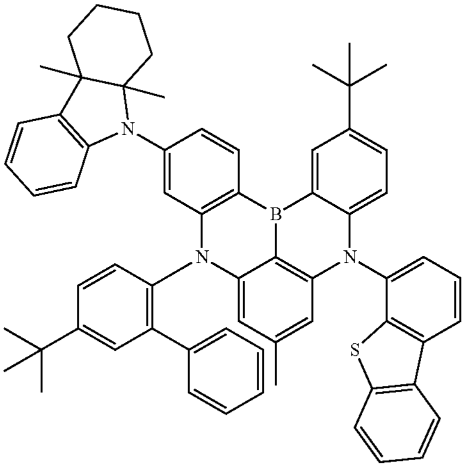
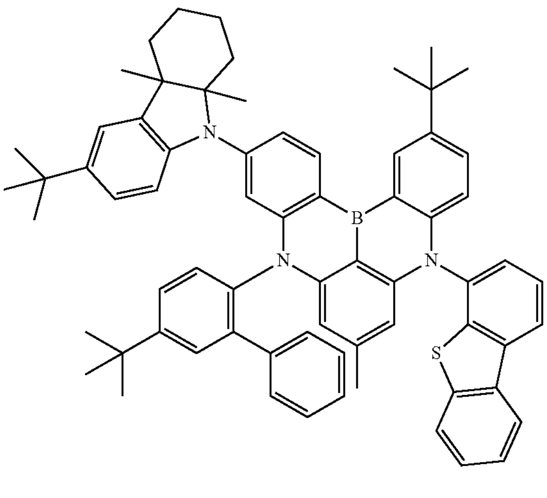
-continued
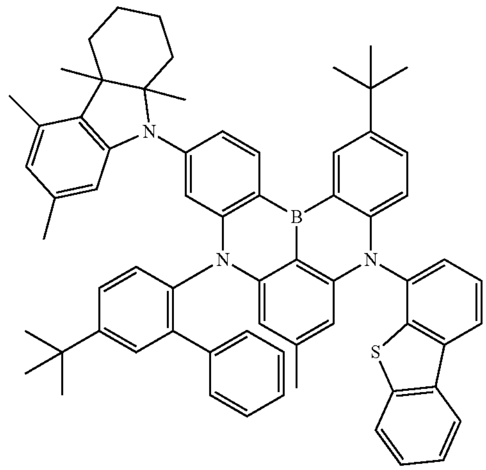
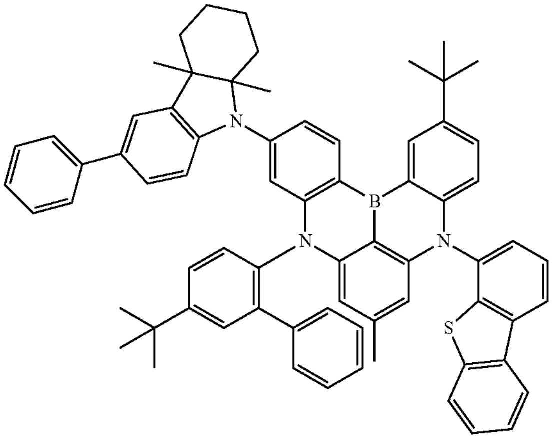
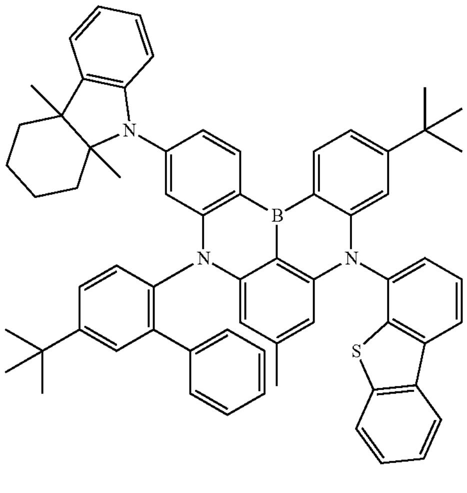

-continued
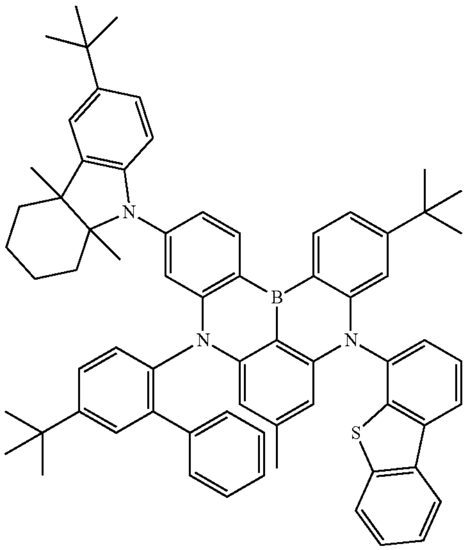
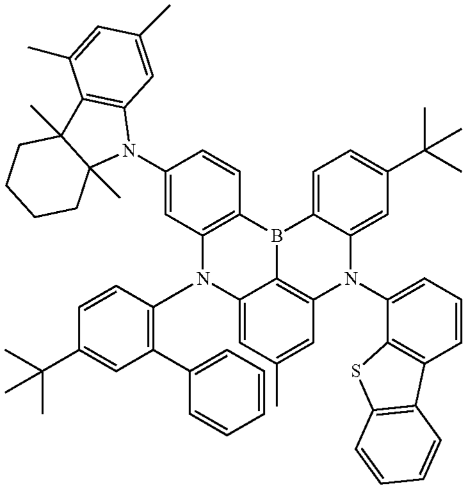
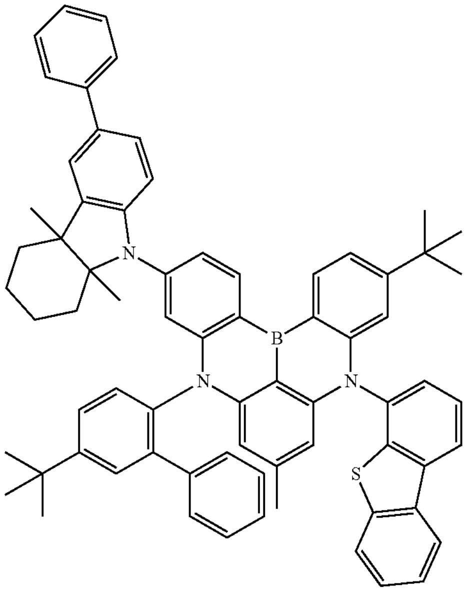
-continued
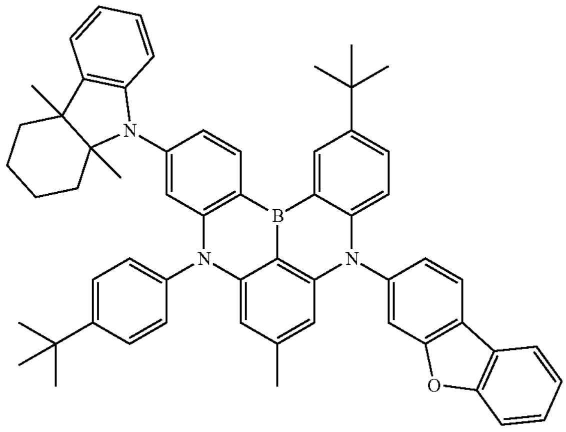
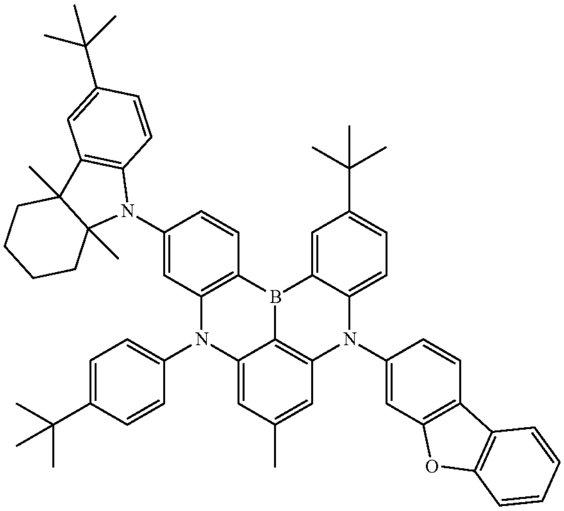
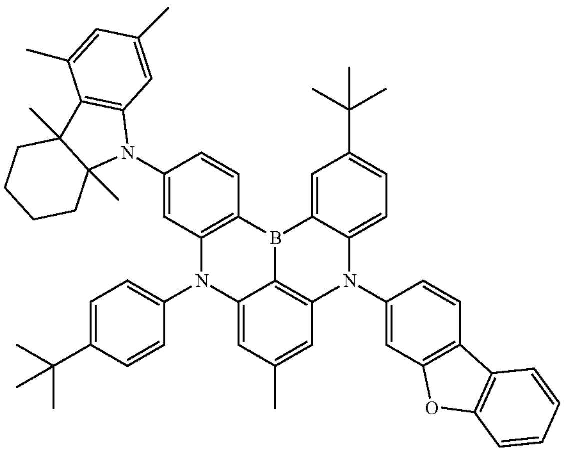

-continued
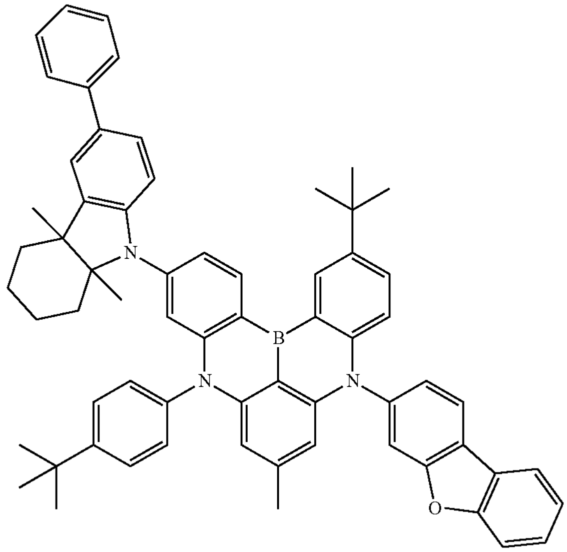
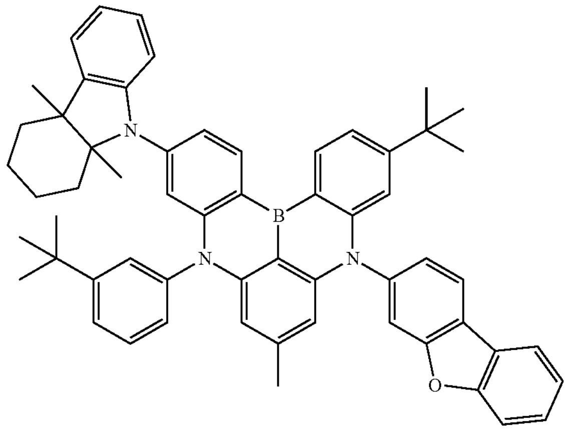
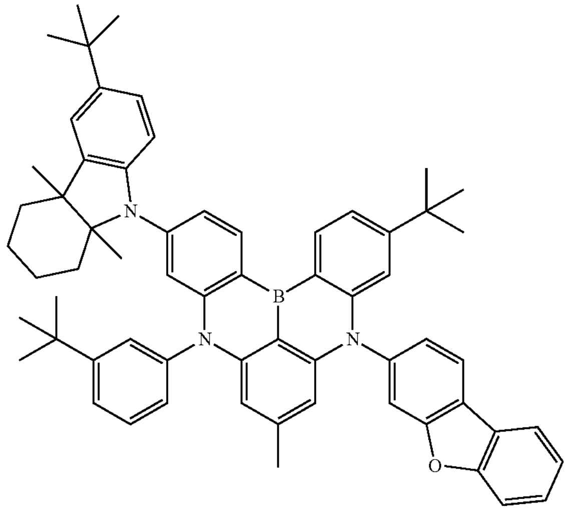
-continued
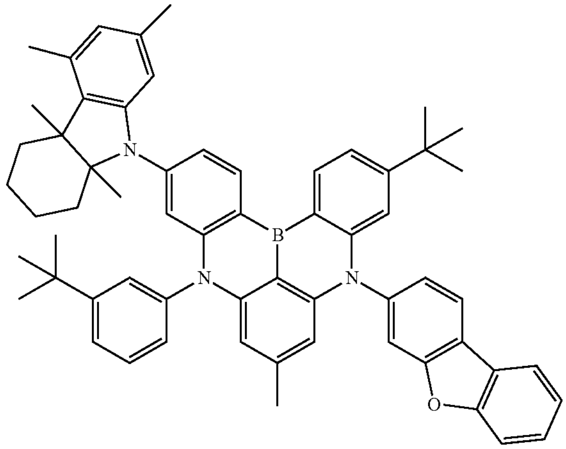
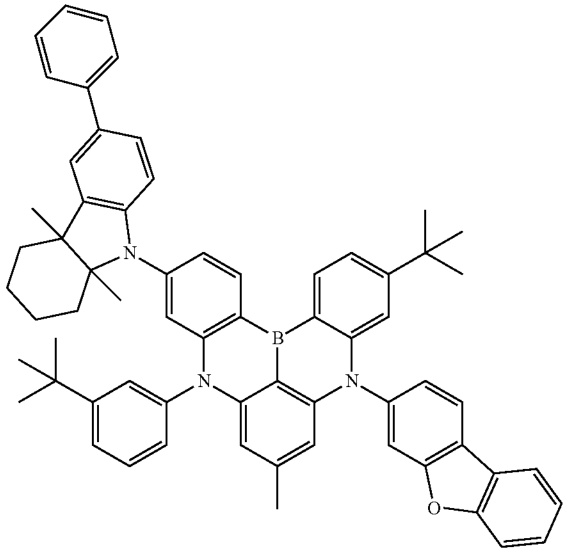
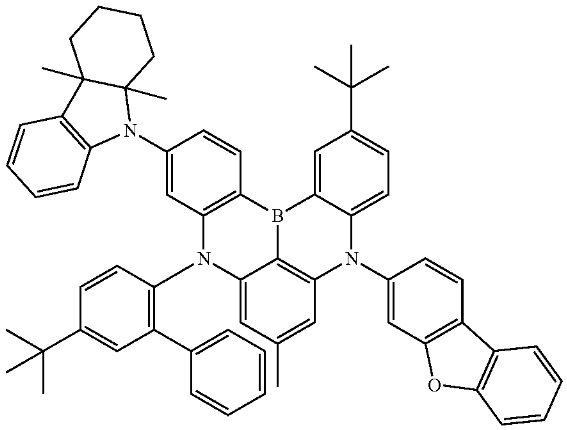

-continued
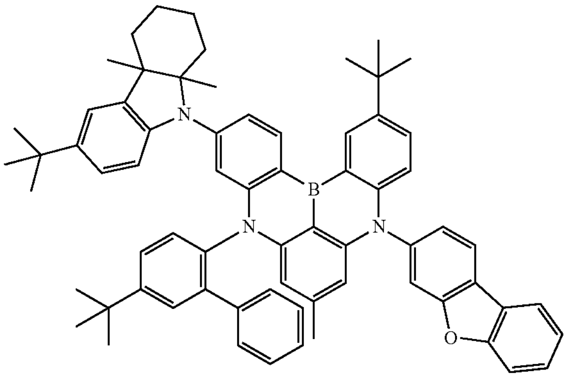
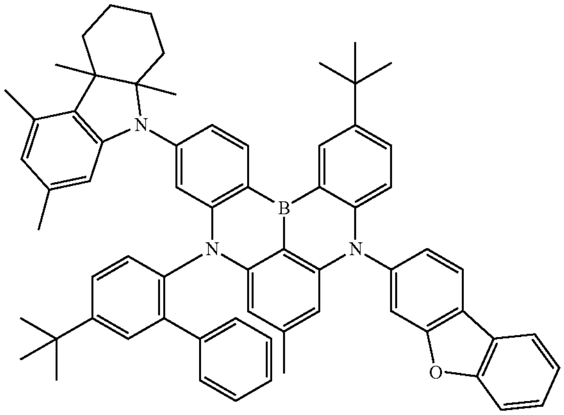
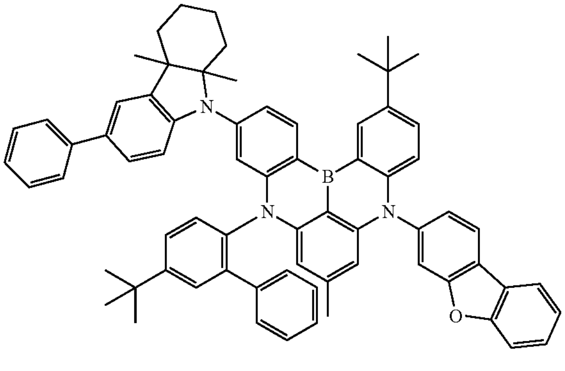
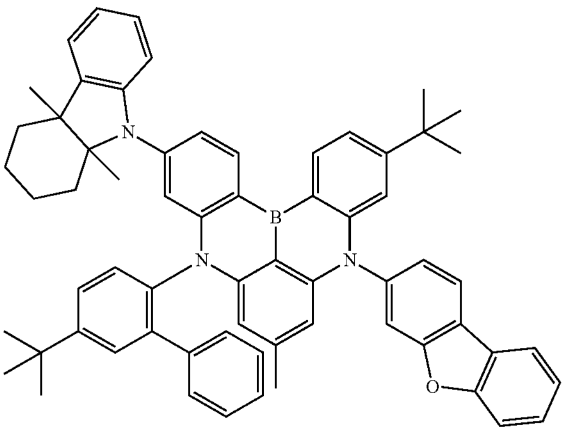
-continued
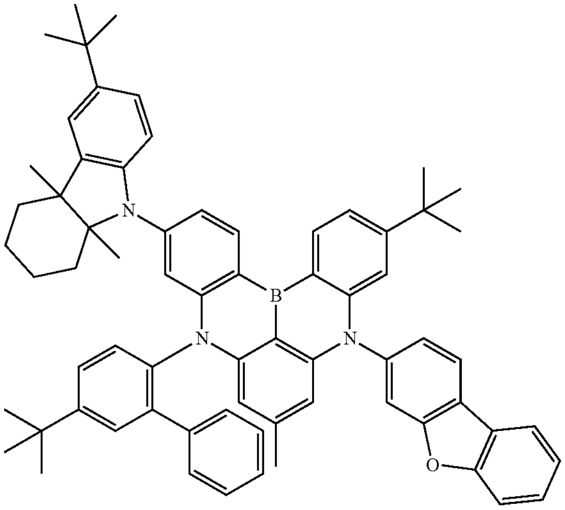
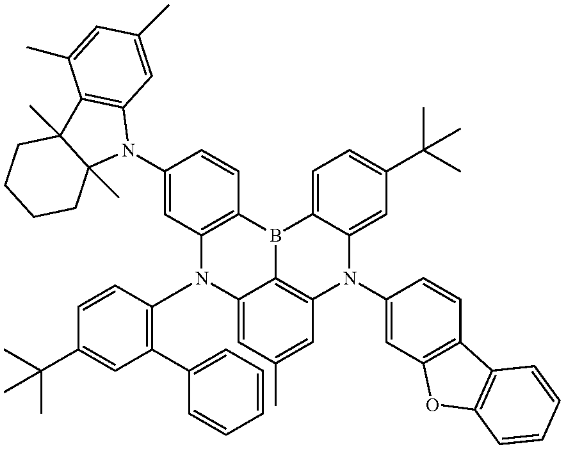
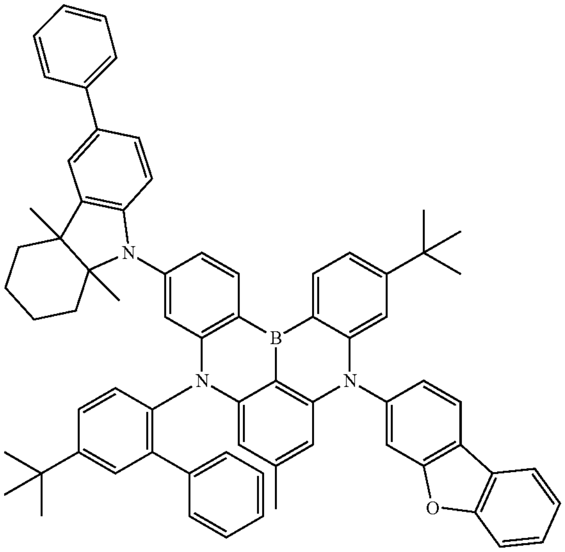

-continued
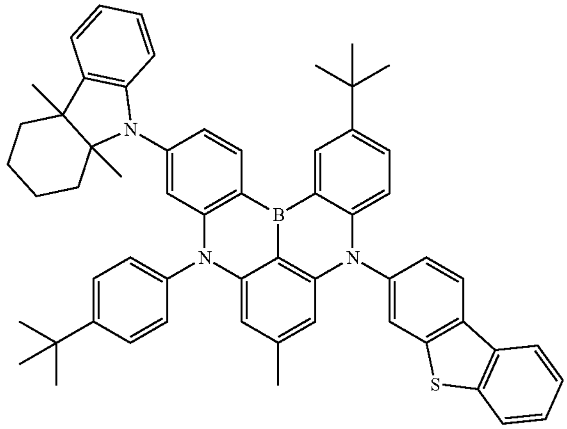
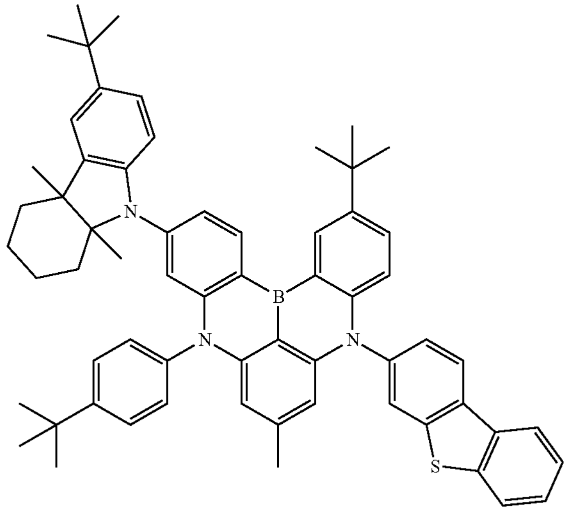
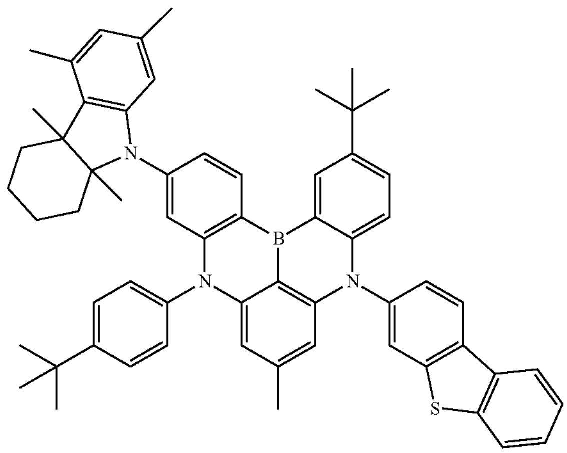
-continued
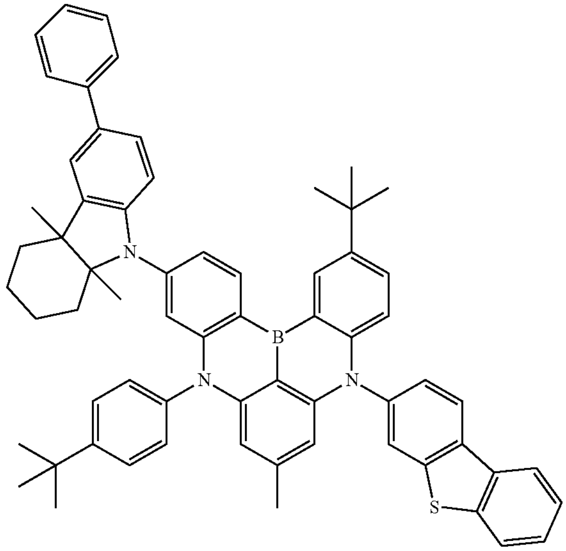
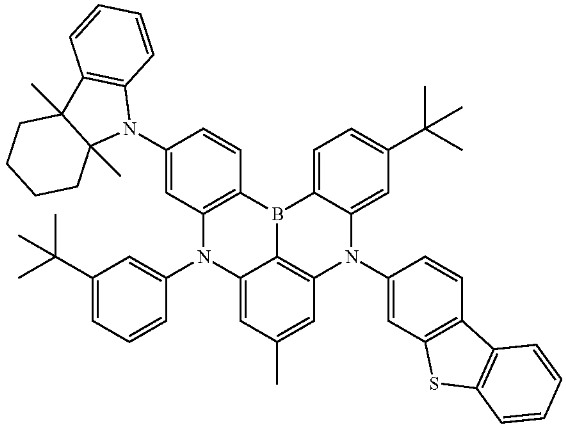
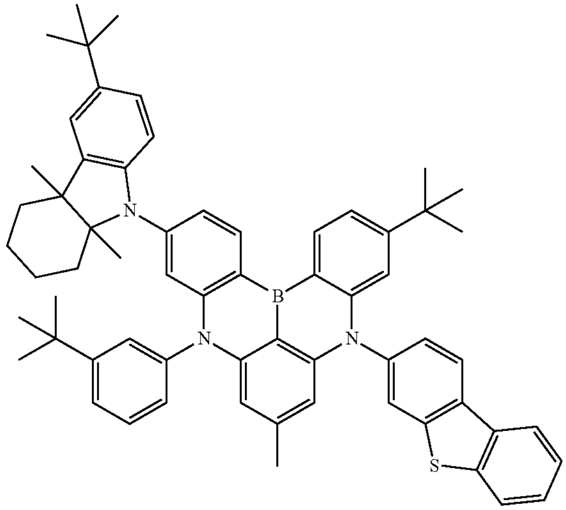

-continued
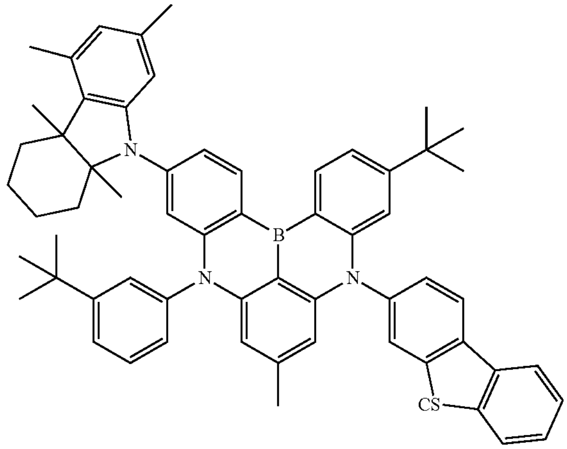
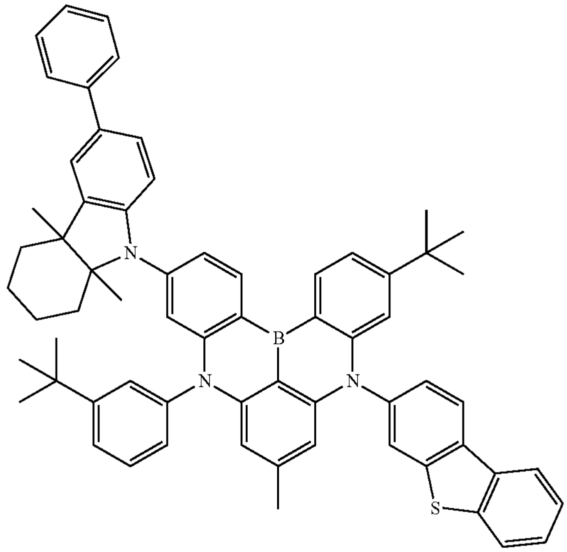
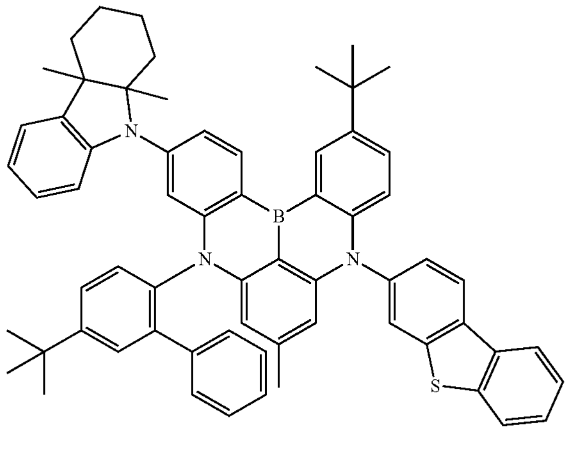
-continued
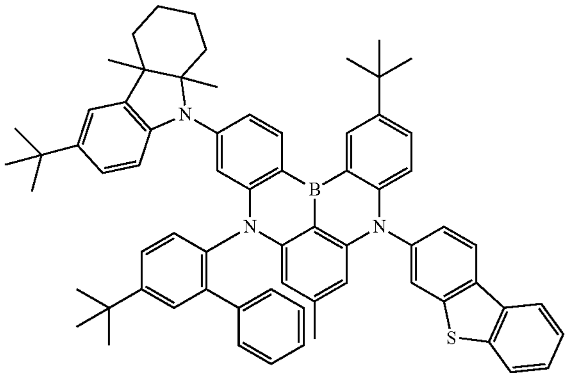
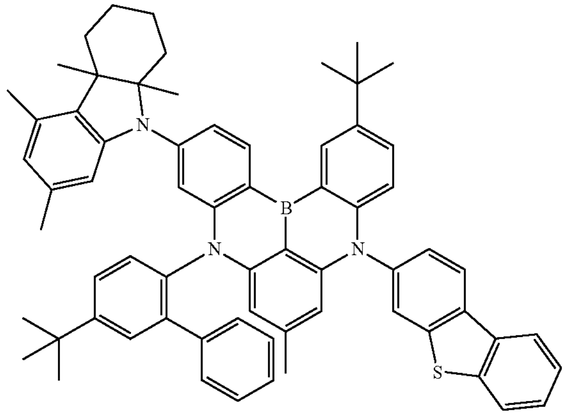
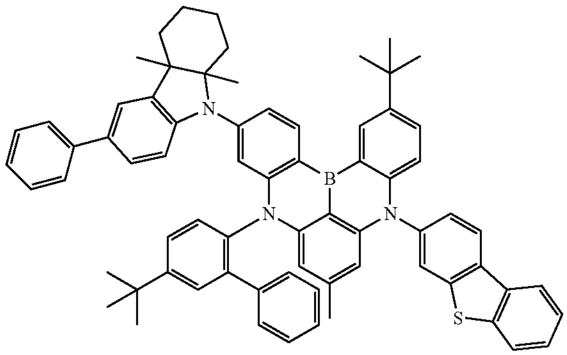
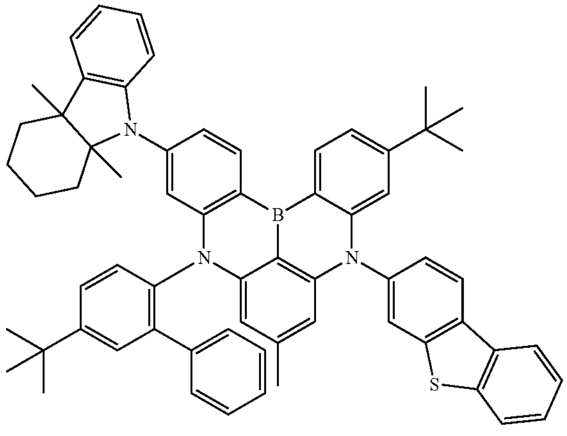

-continued
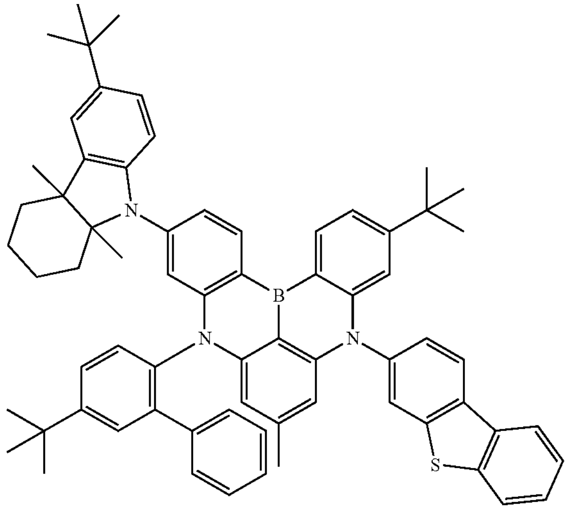
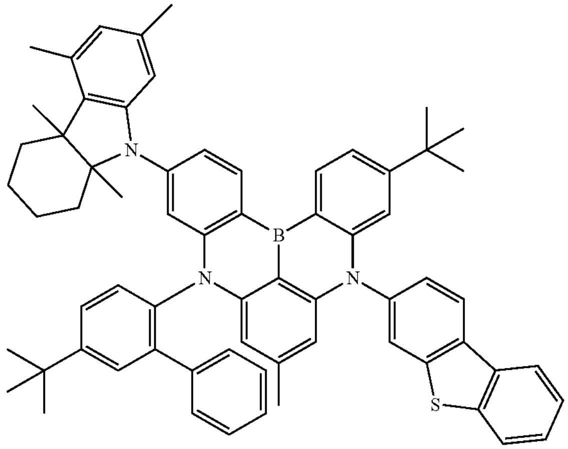
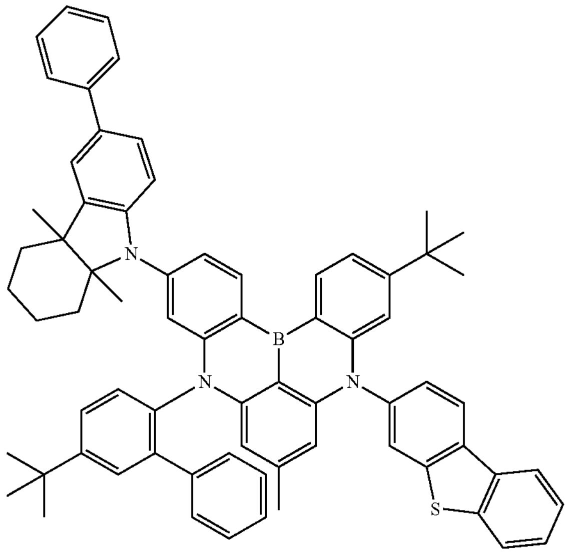
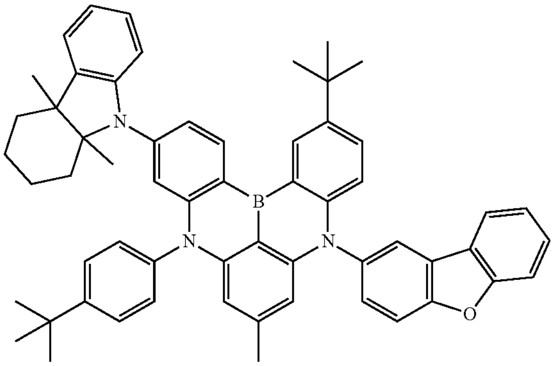
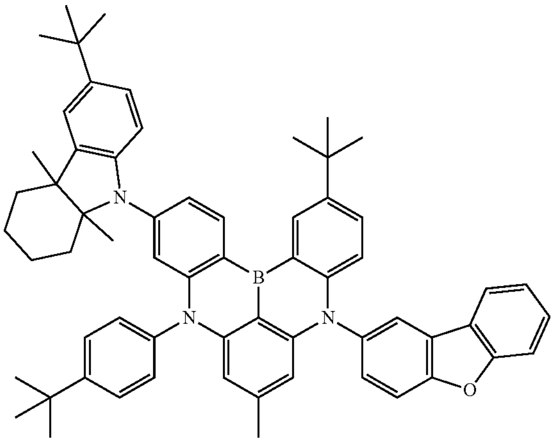
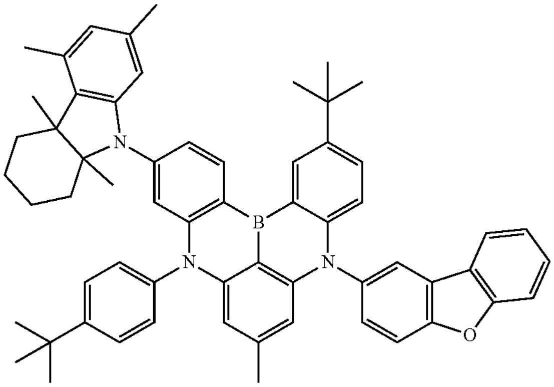
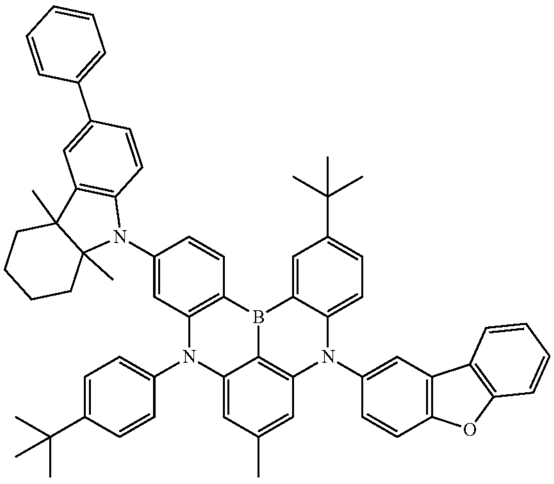

-continued
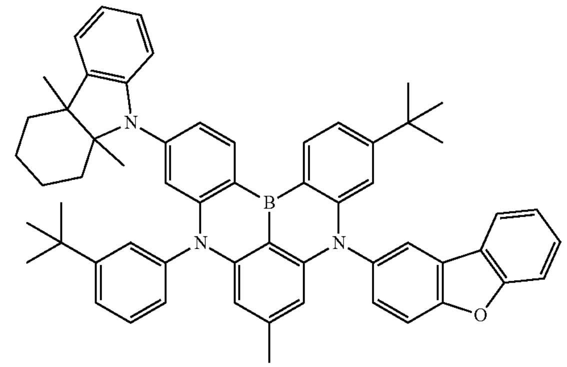
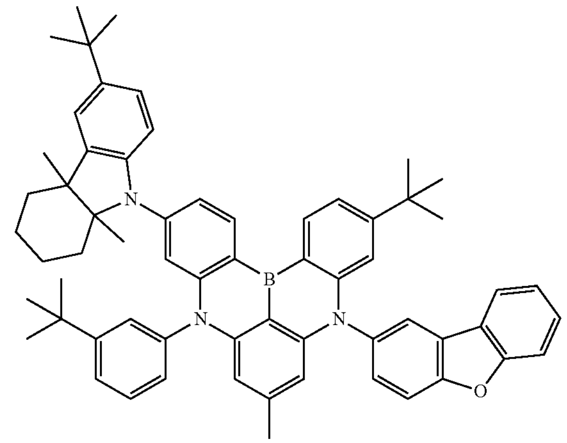
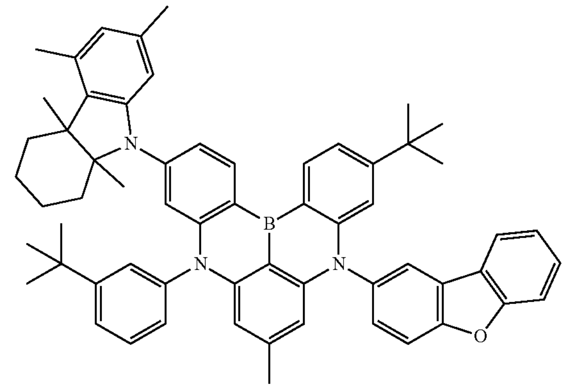
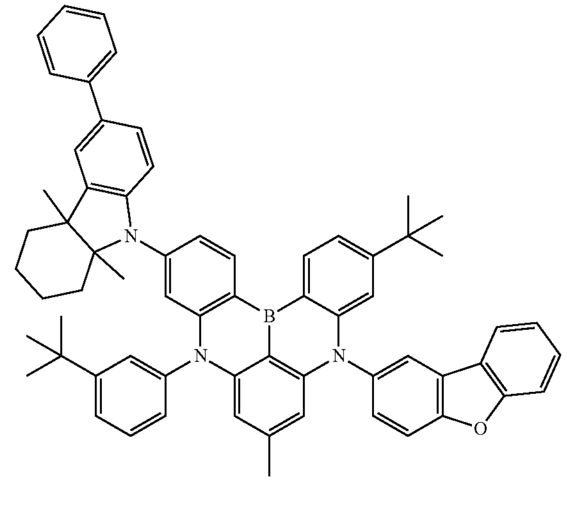
-continued
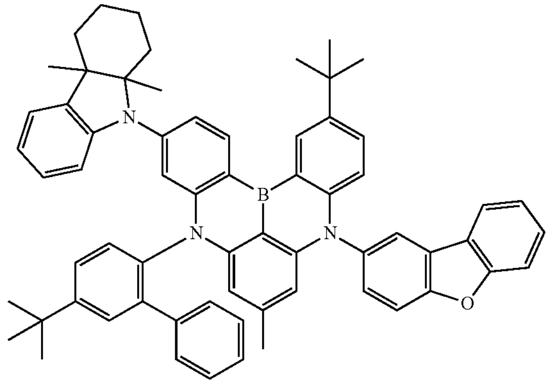
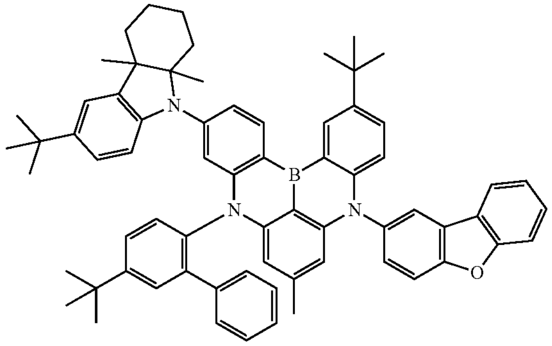
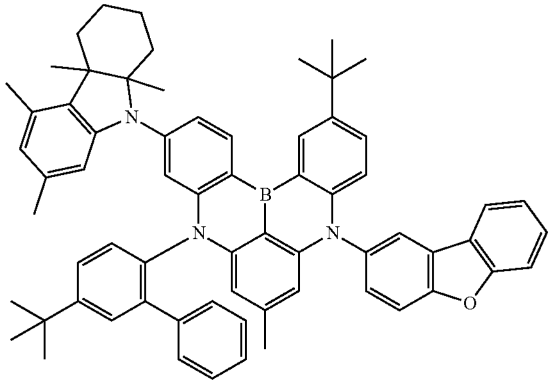
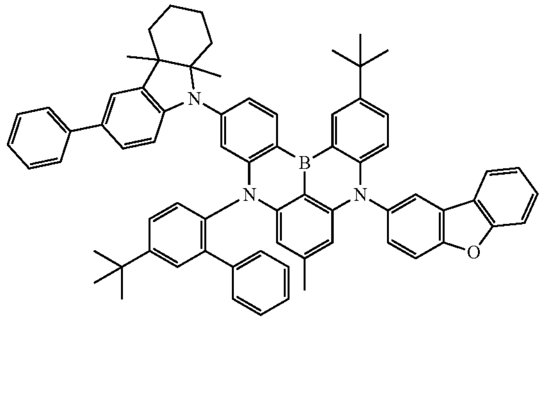

-continued
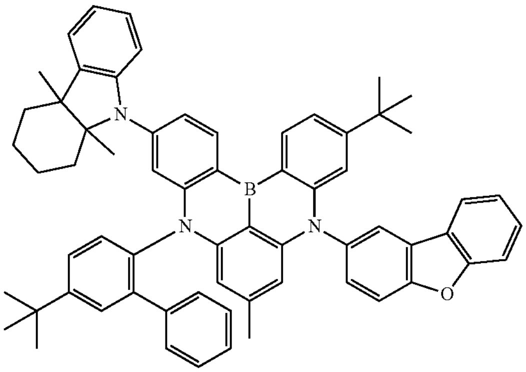
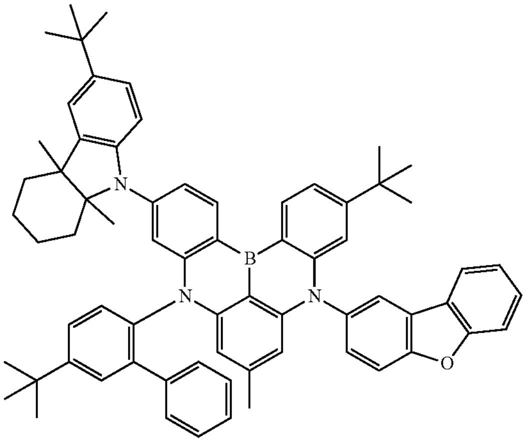
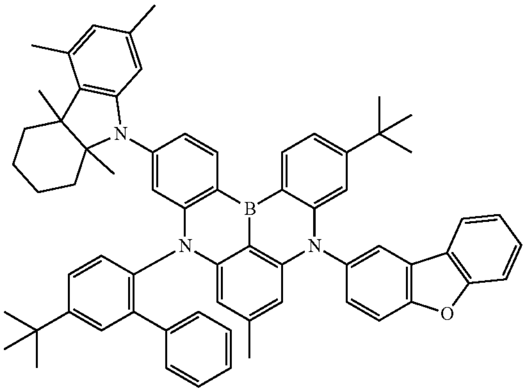
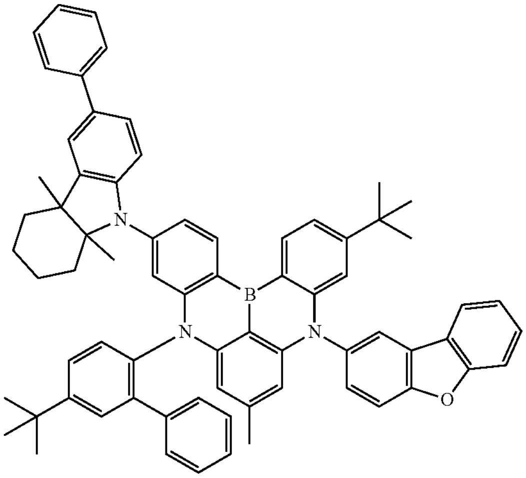
-continued
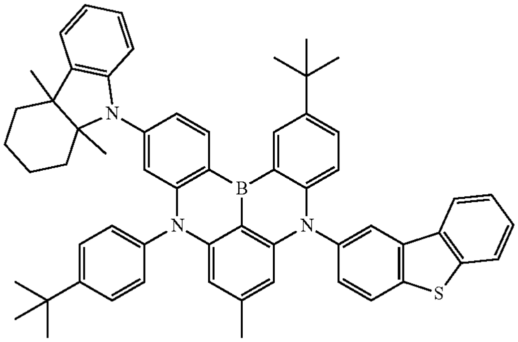
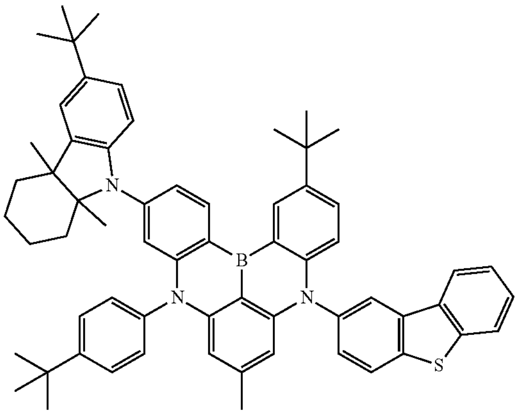
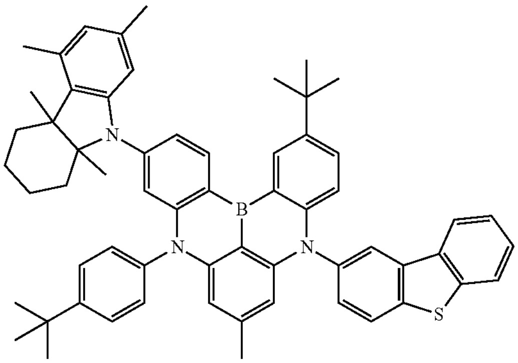
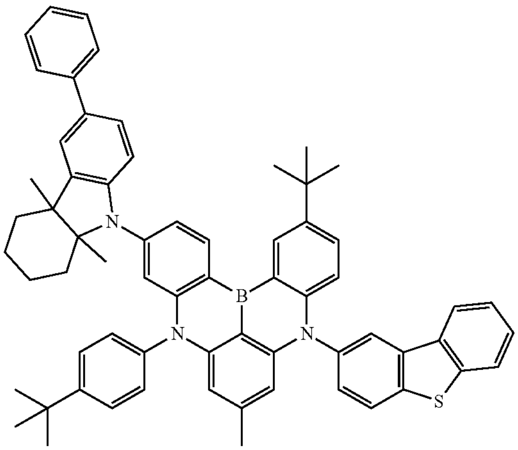

-continued
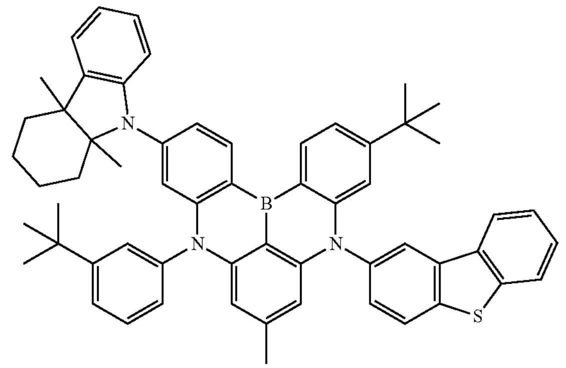
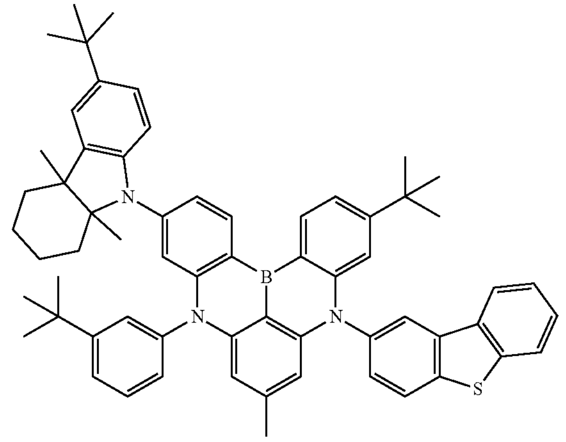
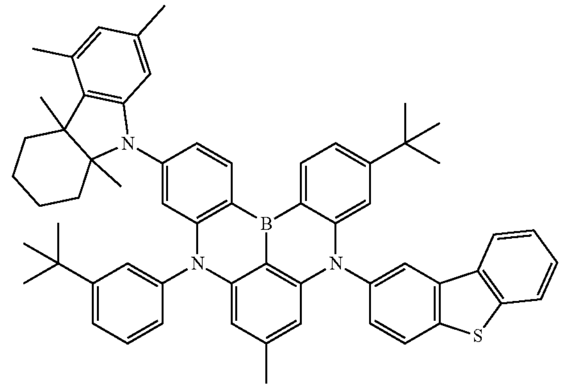
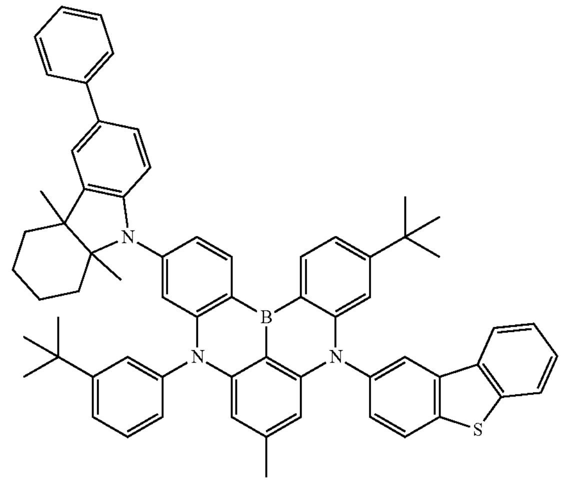
-continued
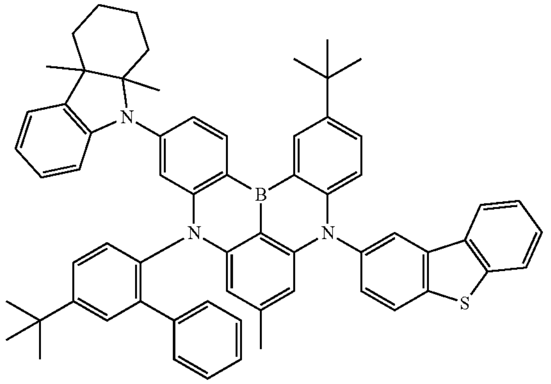
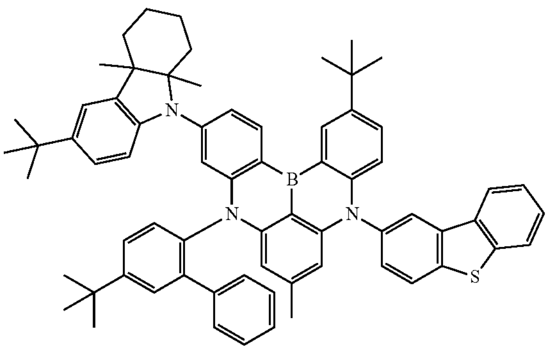
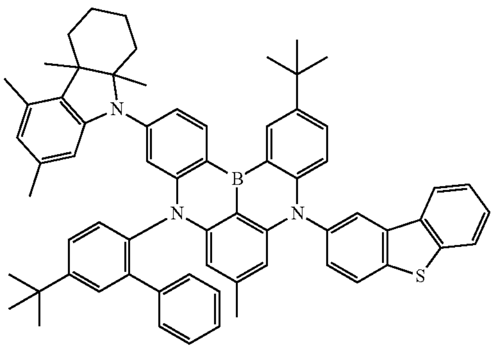
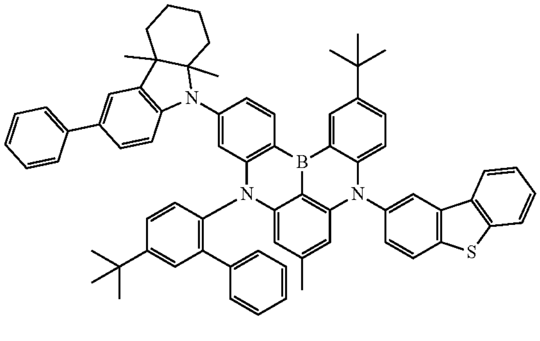

-continued
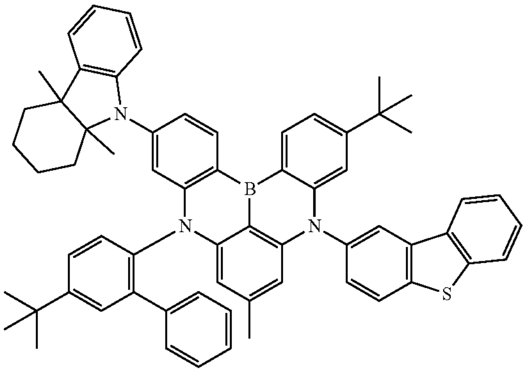
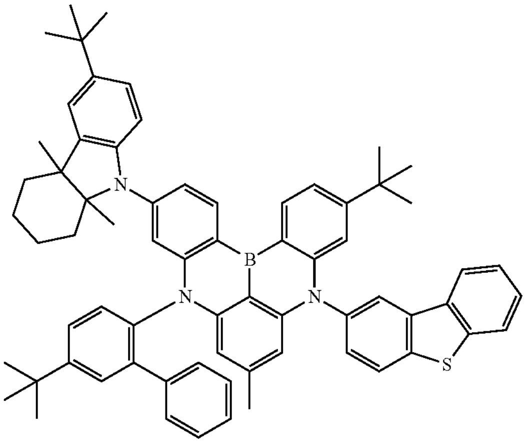
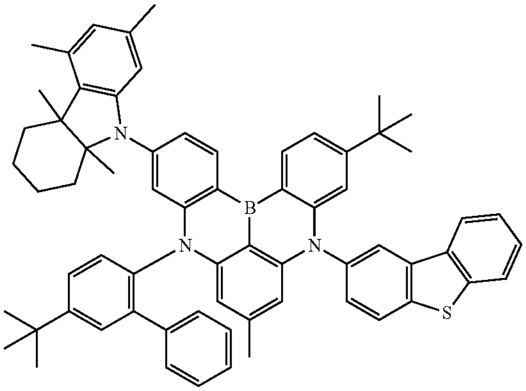
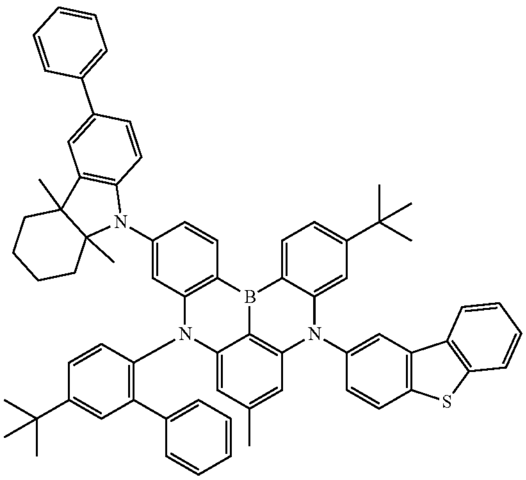
-continued
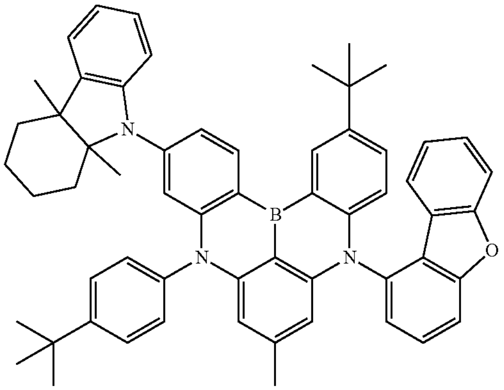
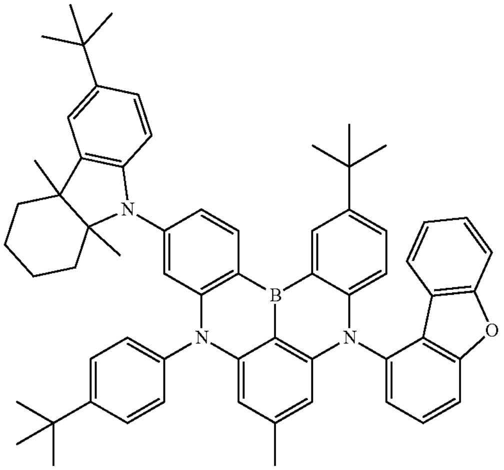
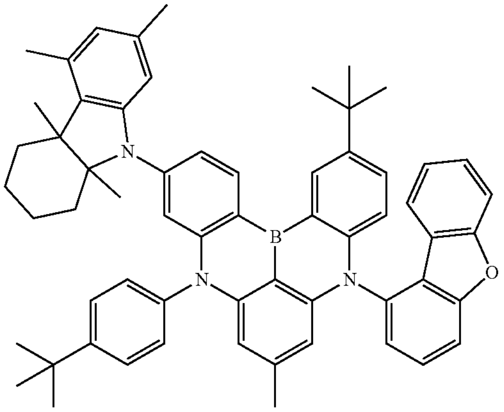

-continued
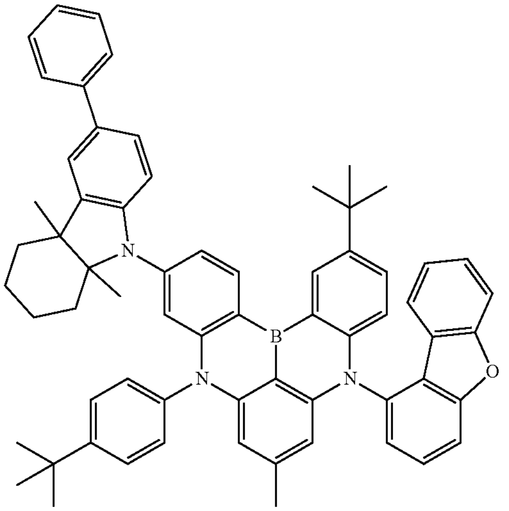
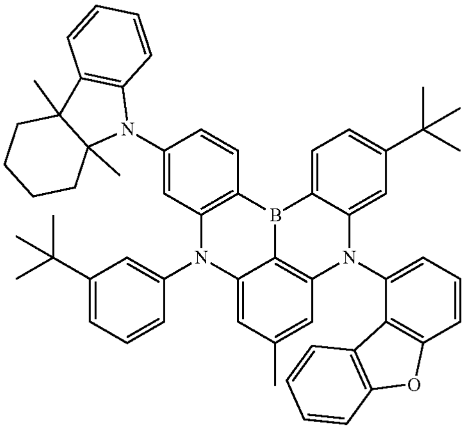
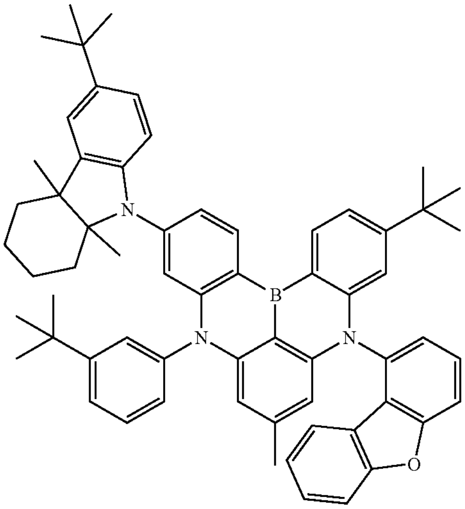
-continued
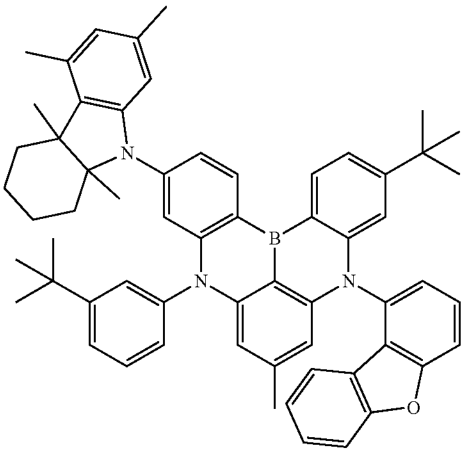
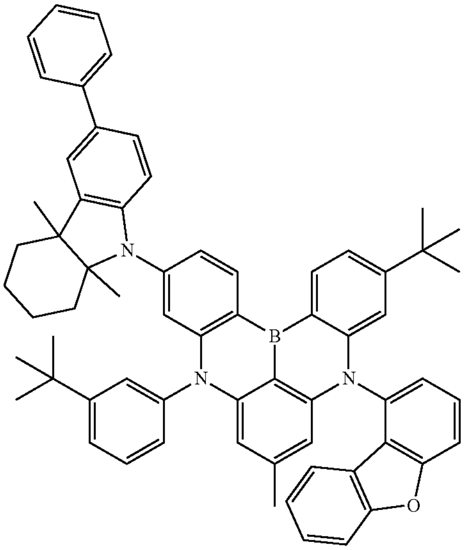
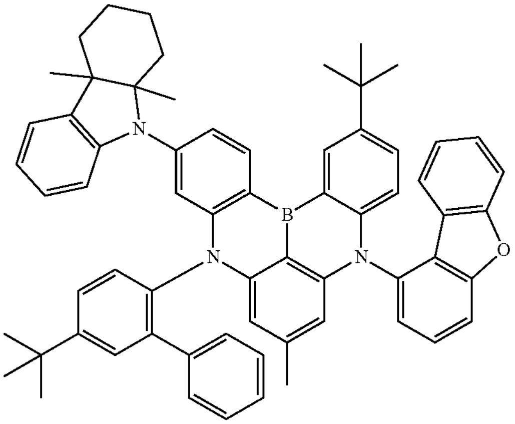

-continued
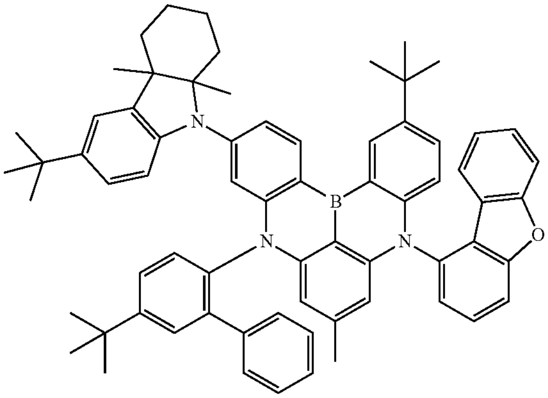
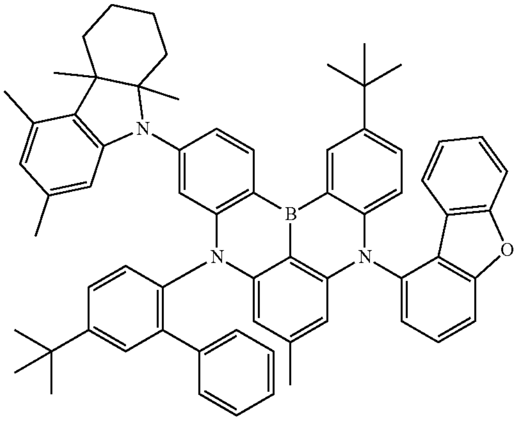
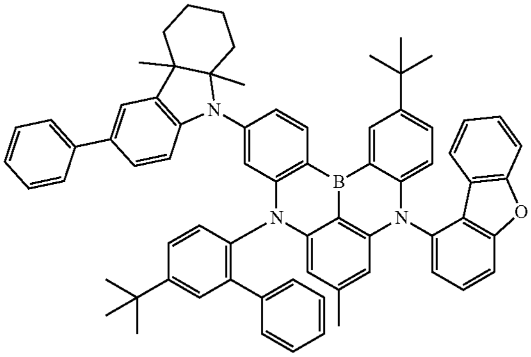
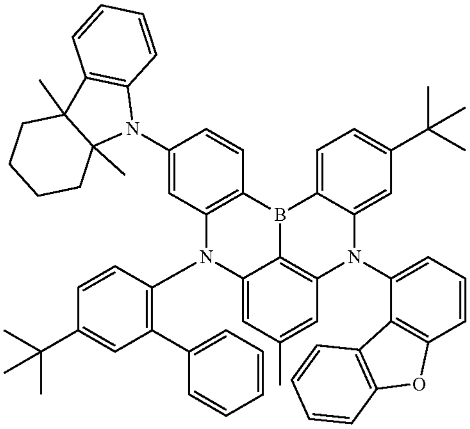
-continued
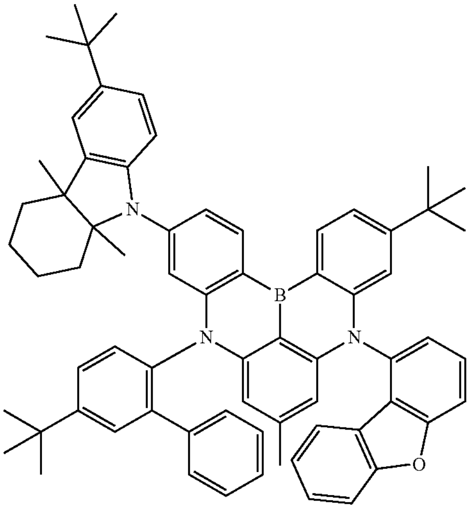
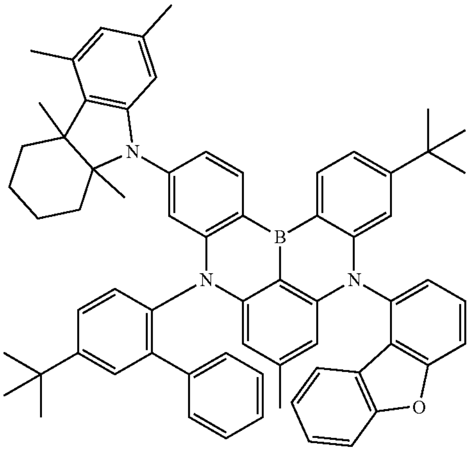
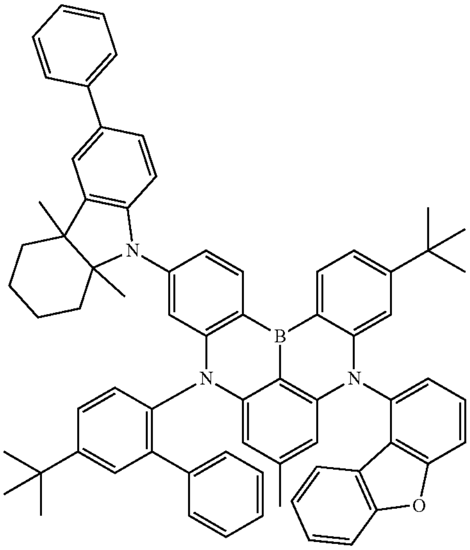

-continued
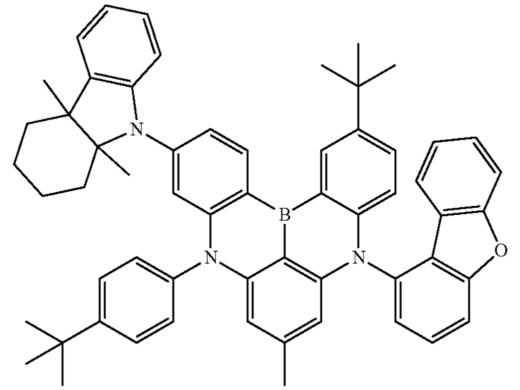
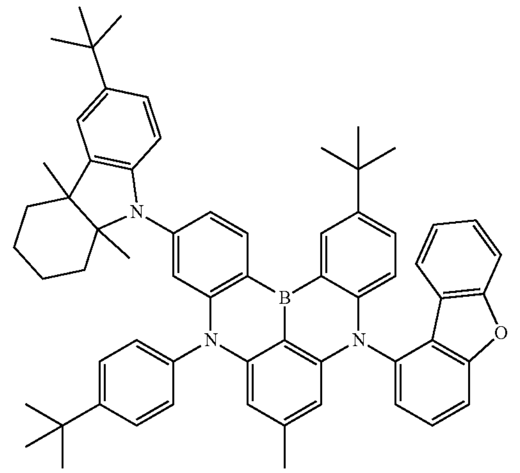
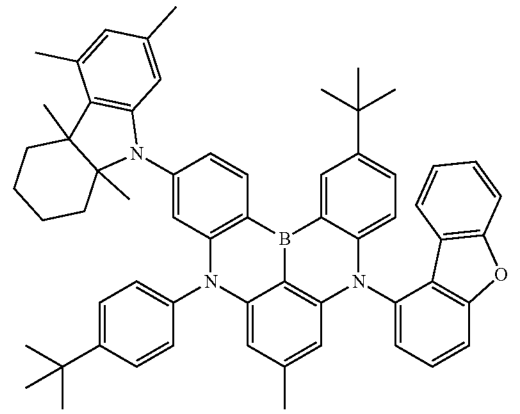
-continued
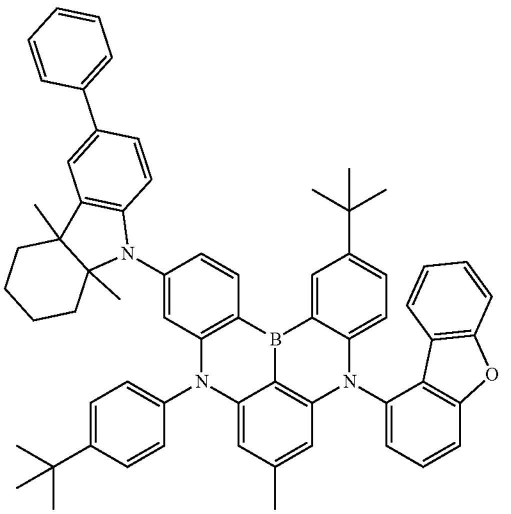
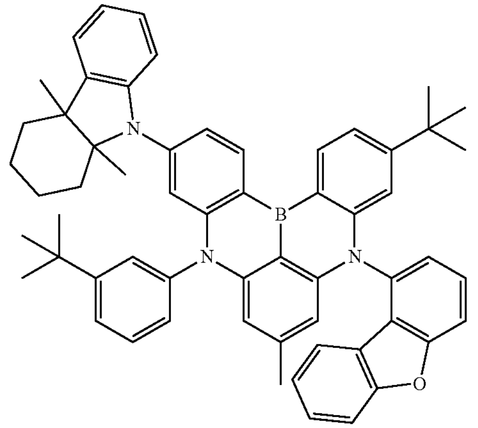
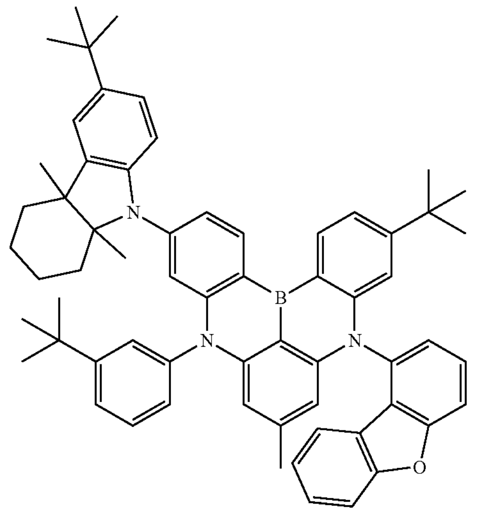

-continued
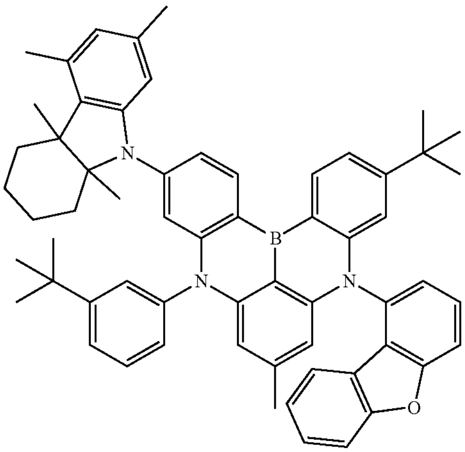
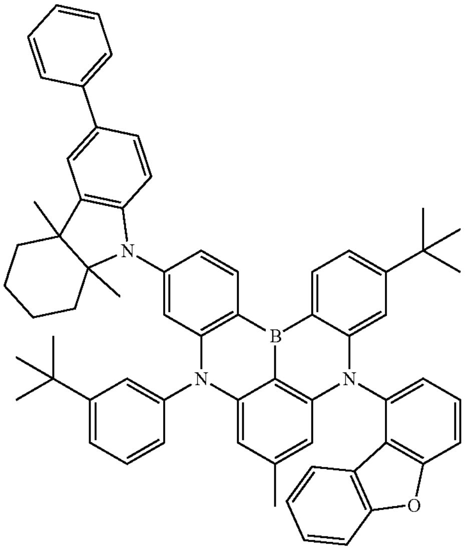
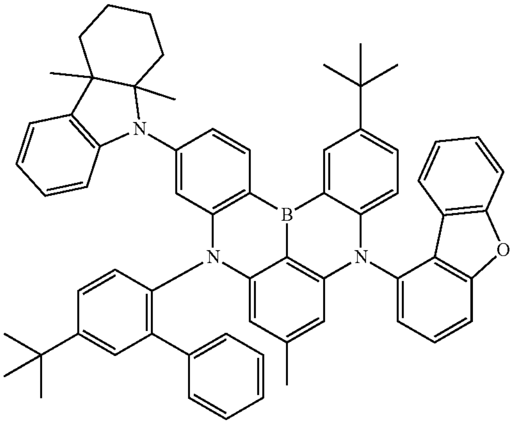
-continued
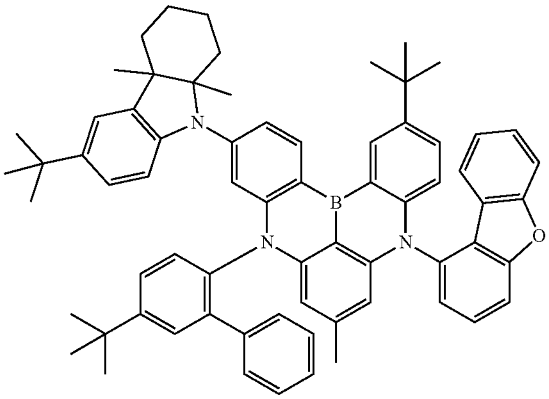
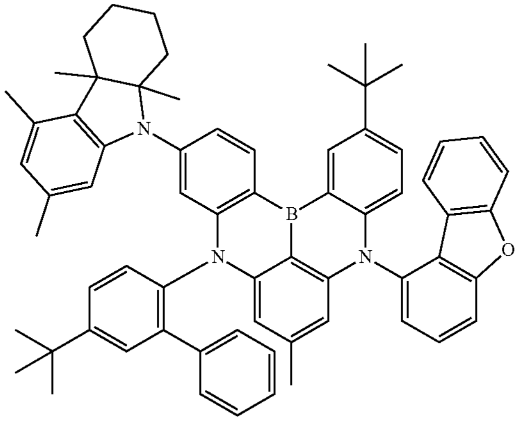
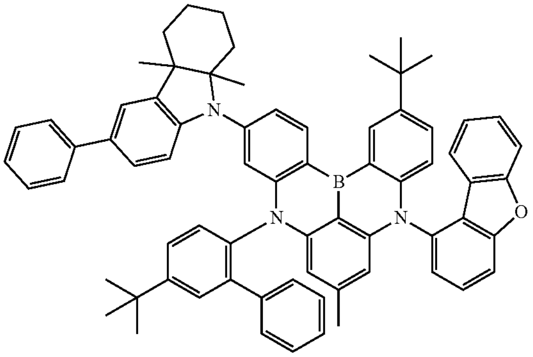
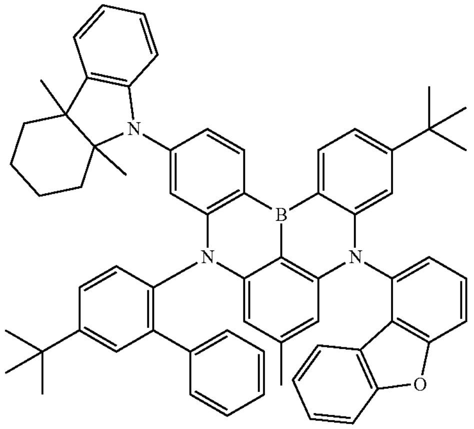

-continued
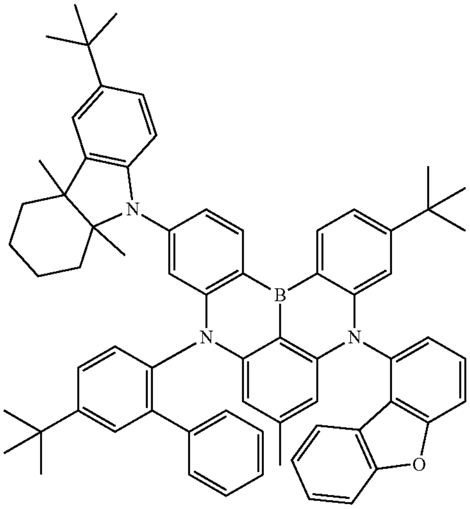
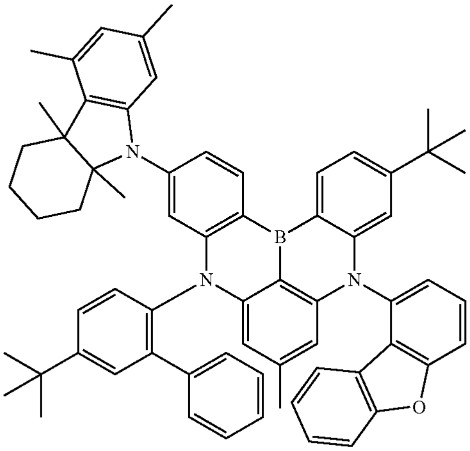
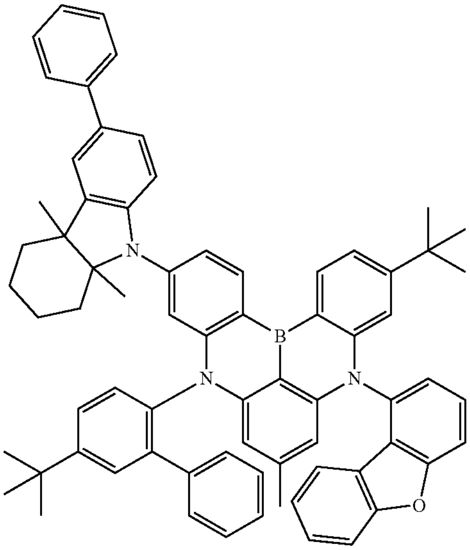
-continued
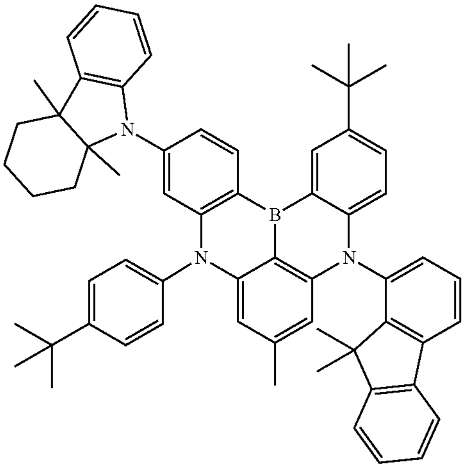
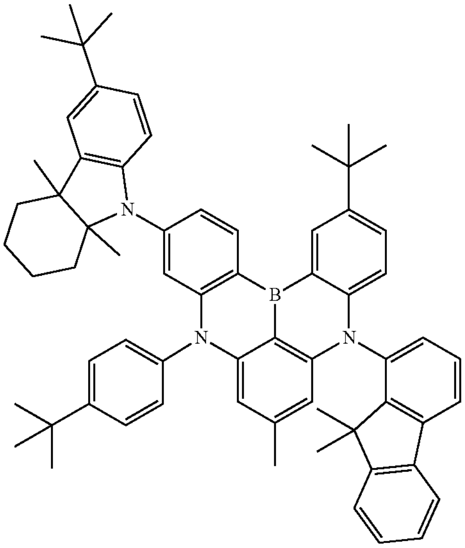
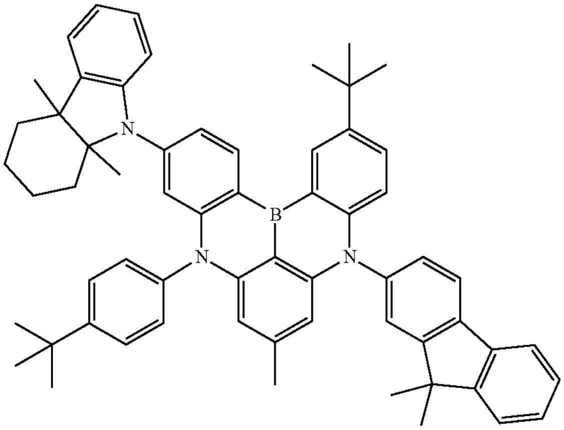

-continued
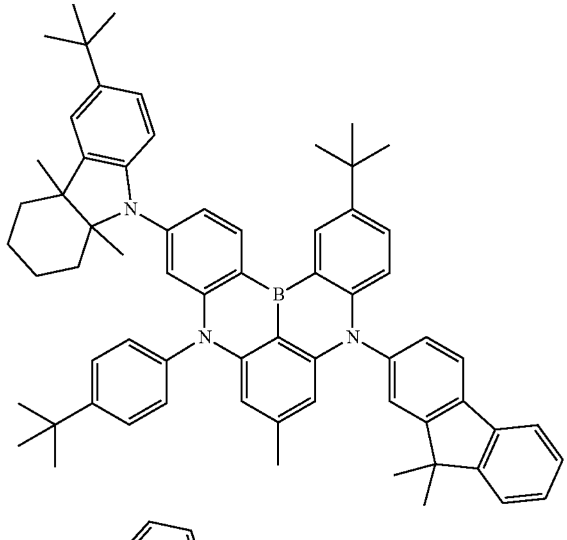
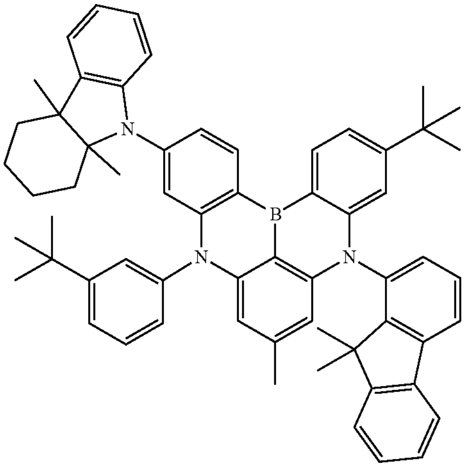
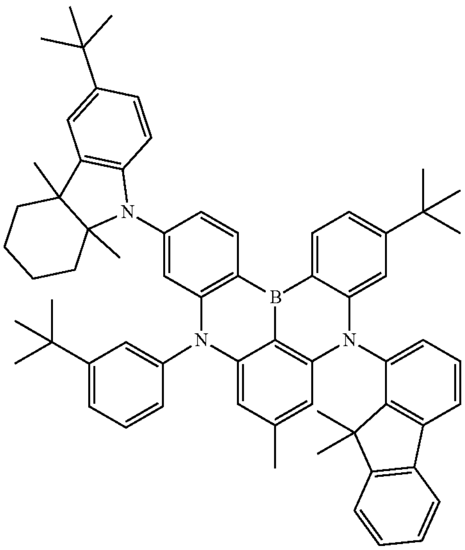
-continued
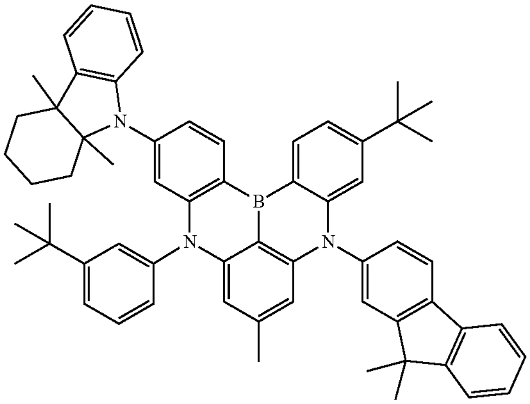
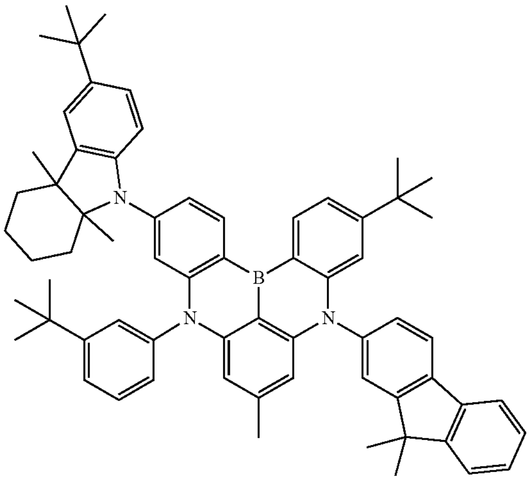
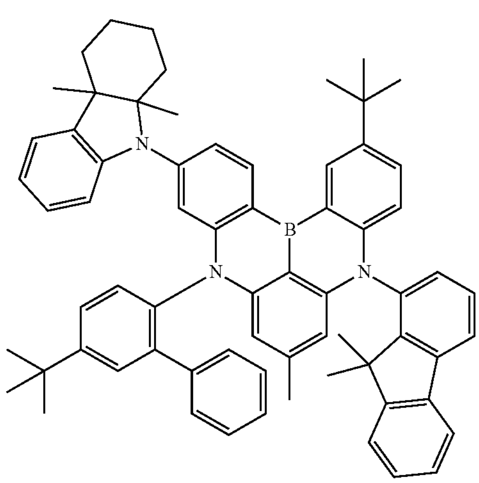

-continued
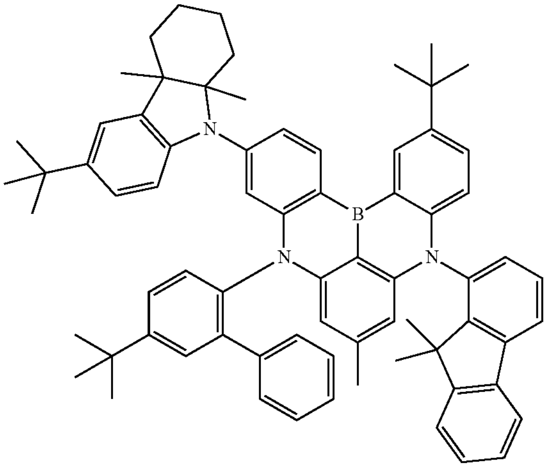
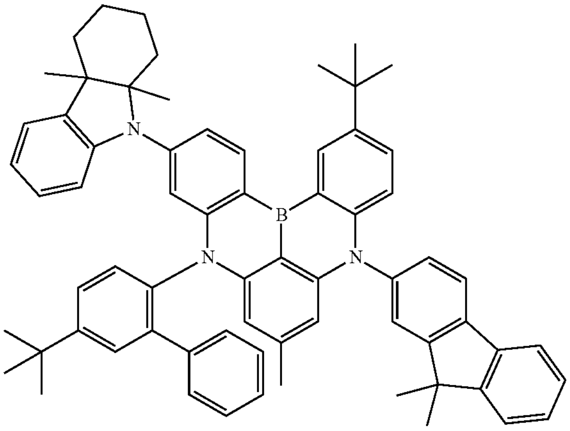
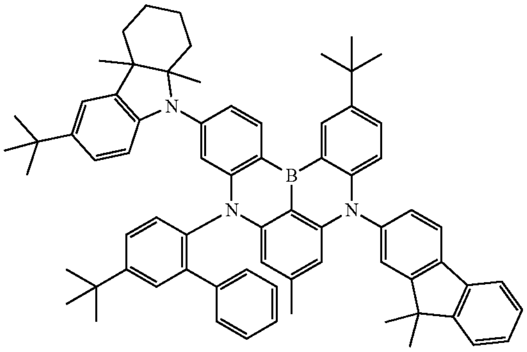
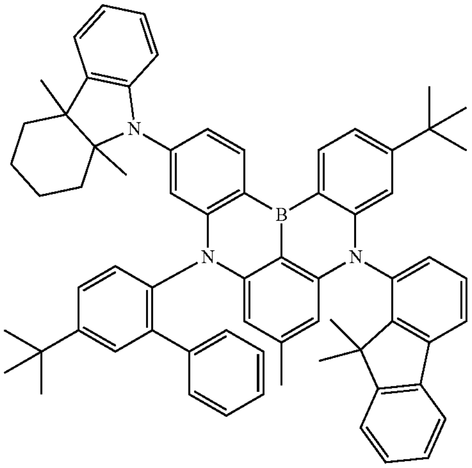
-continued
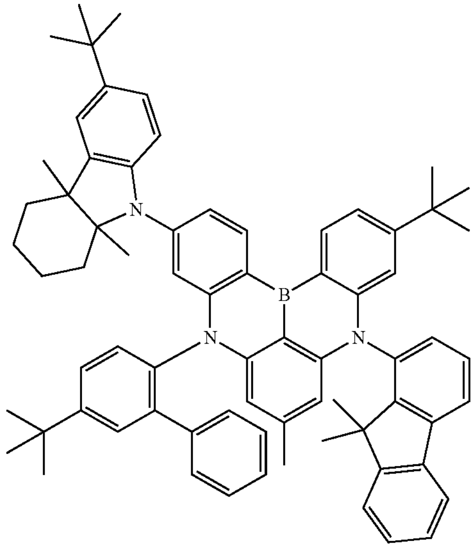
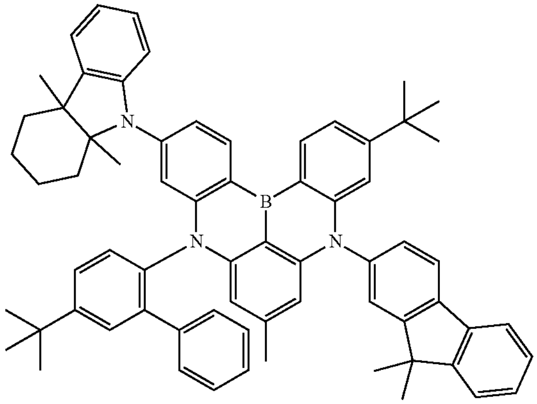
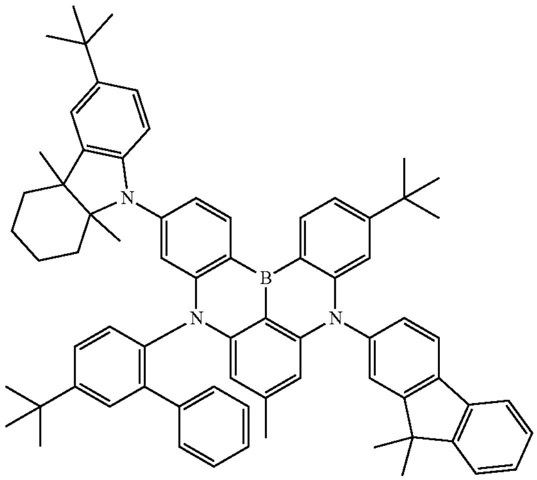

-continued
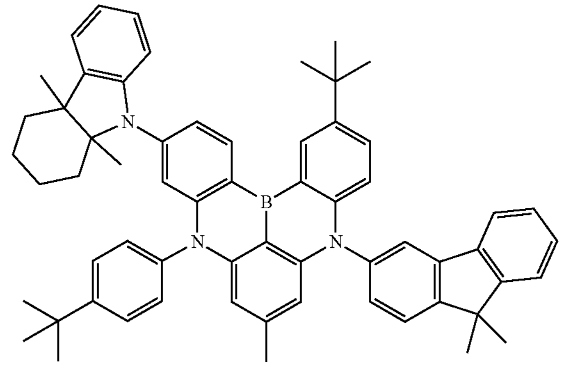
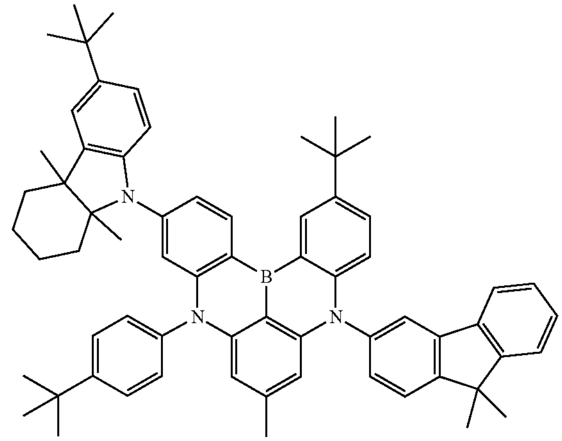
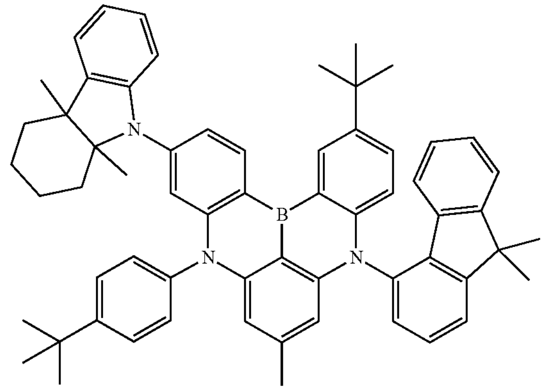
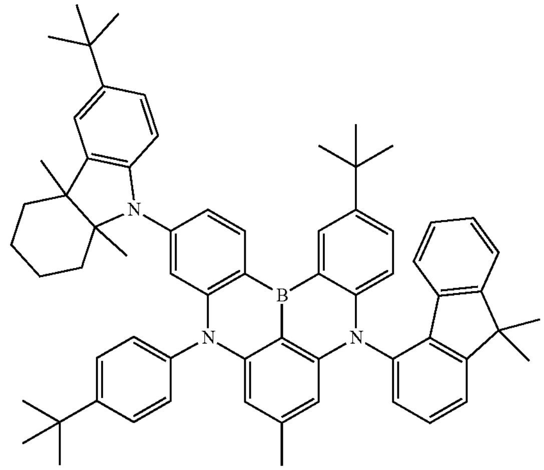
-continued
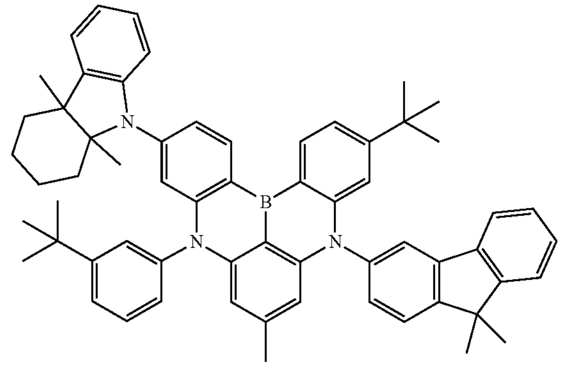
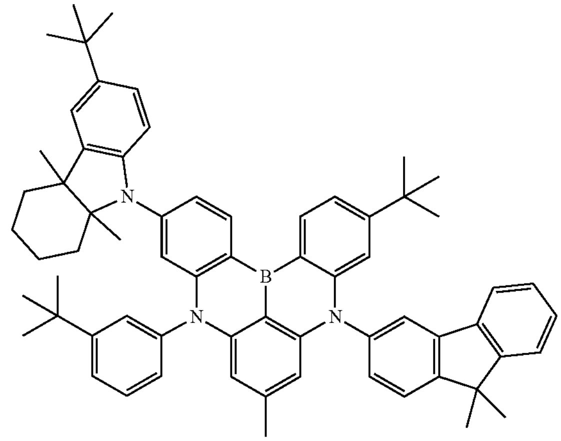
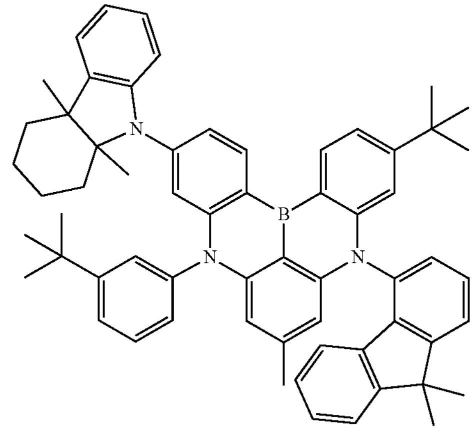

-continued
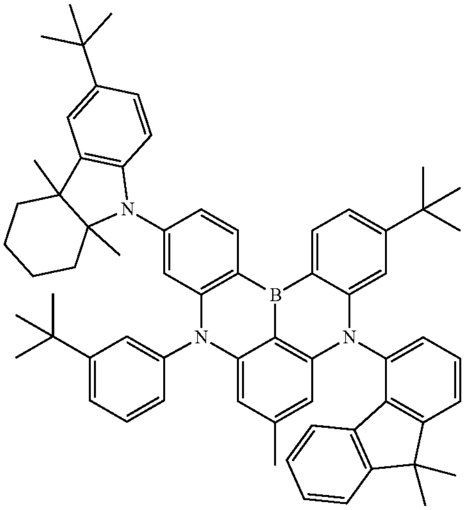
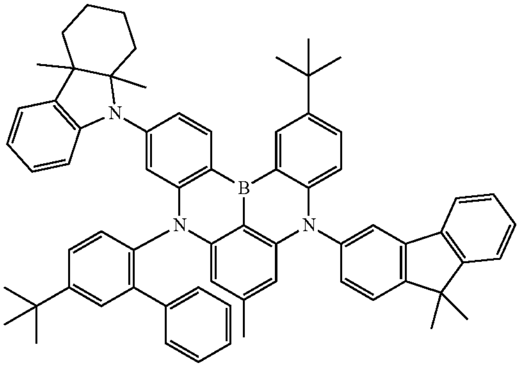
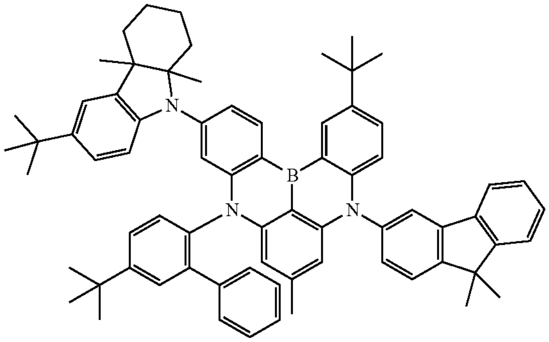
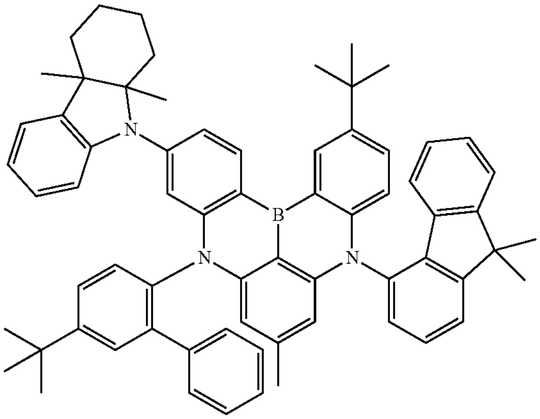
-continued
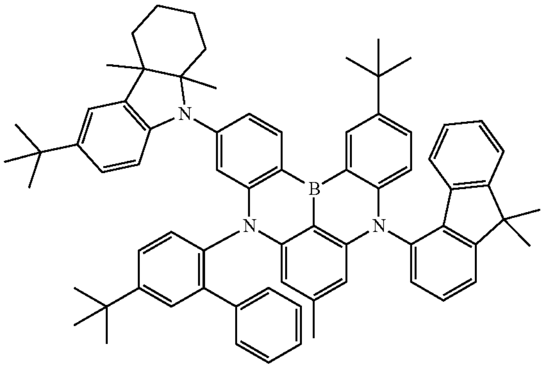
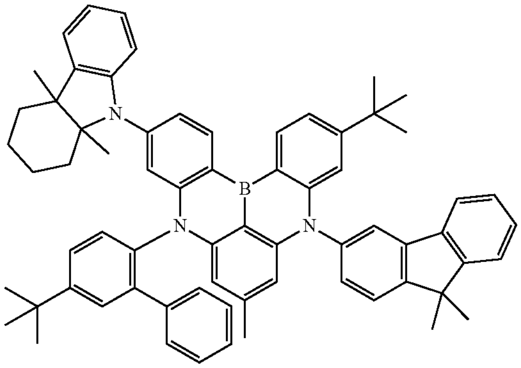
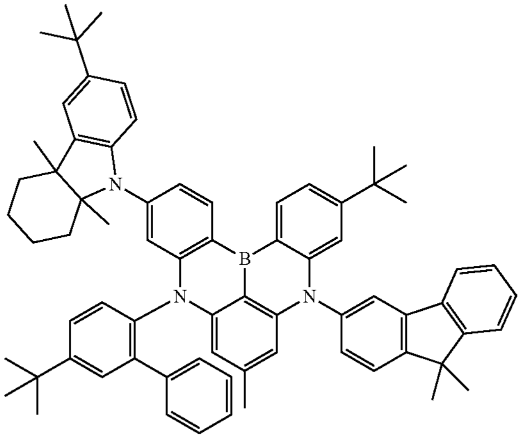
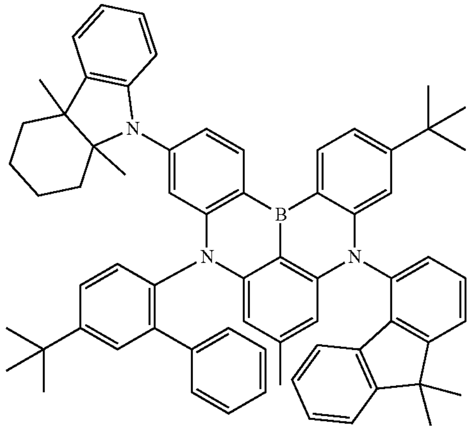

-continued
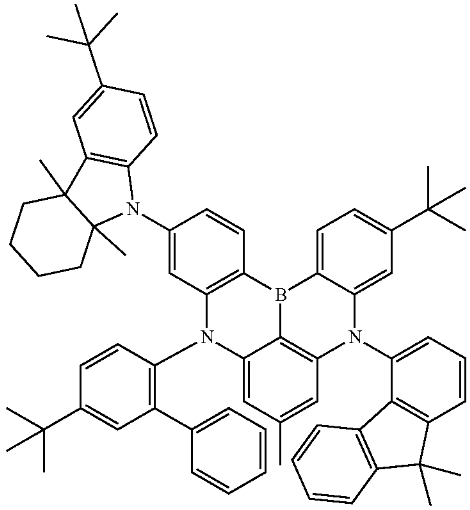
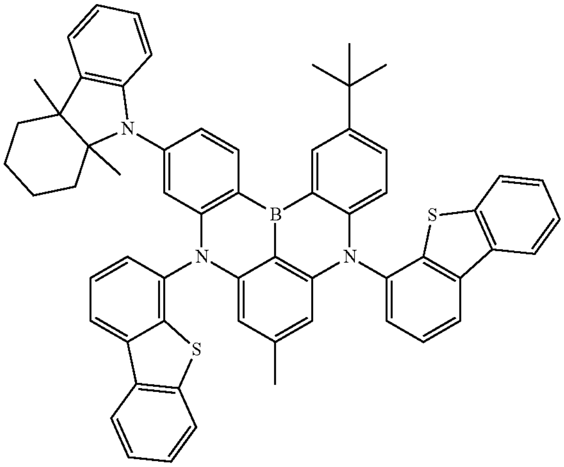
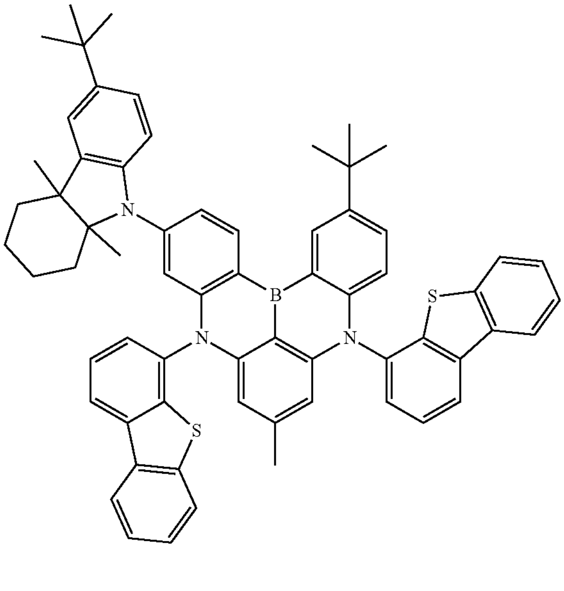
-continued
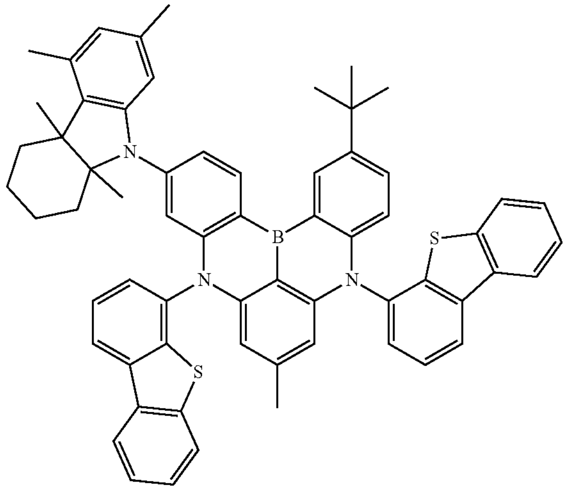
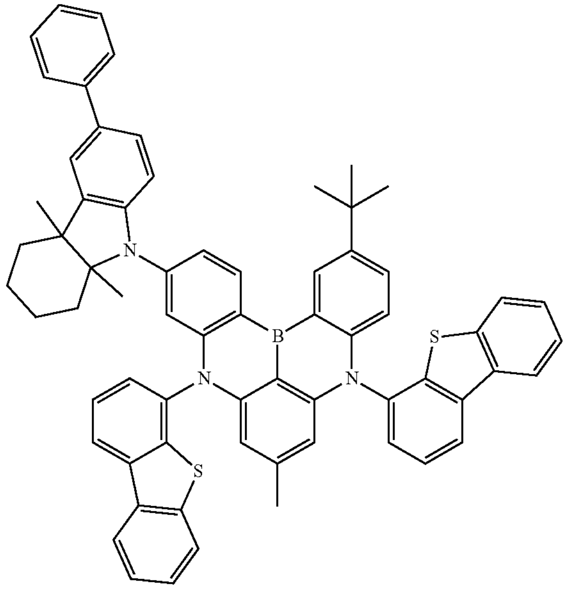
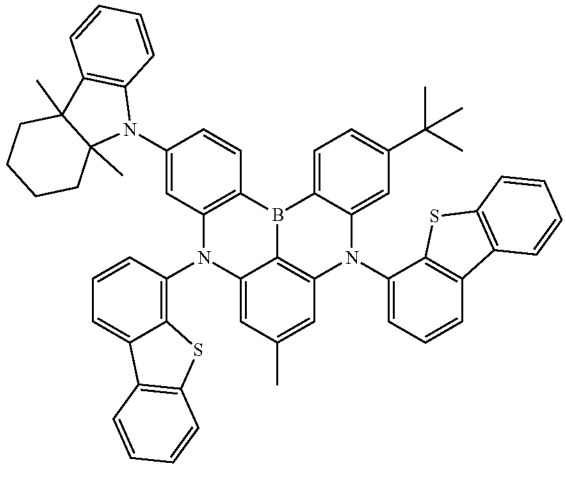

-continued
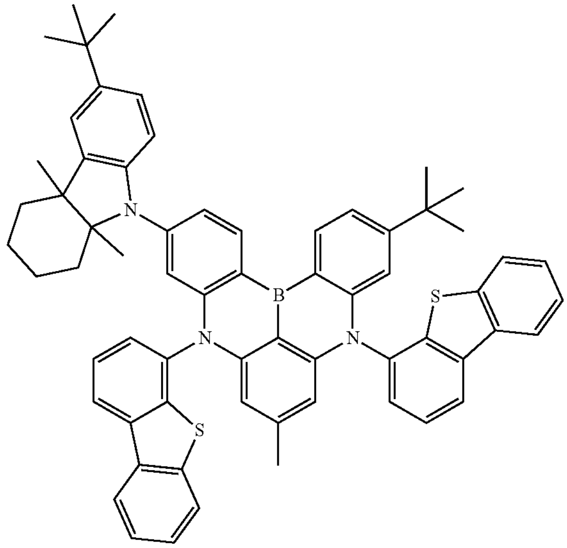
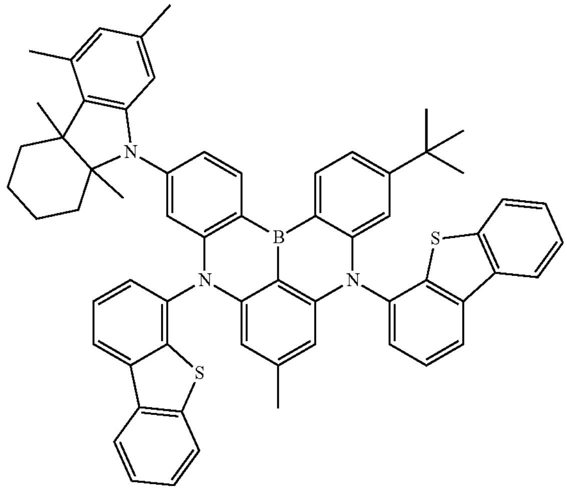
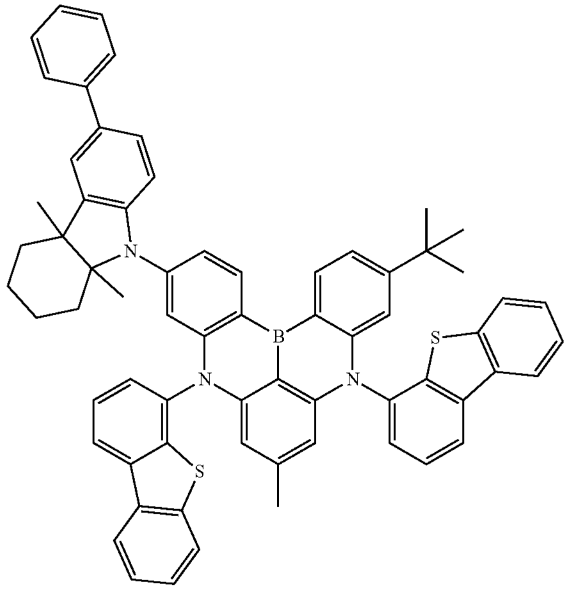
-continued
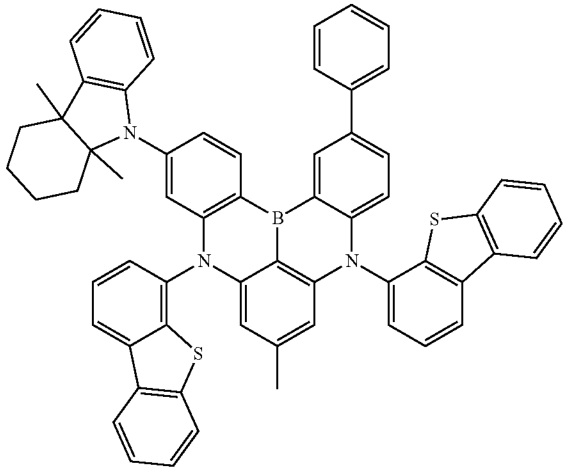
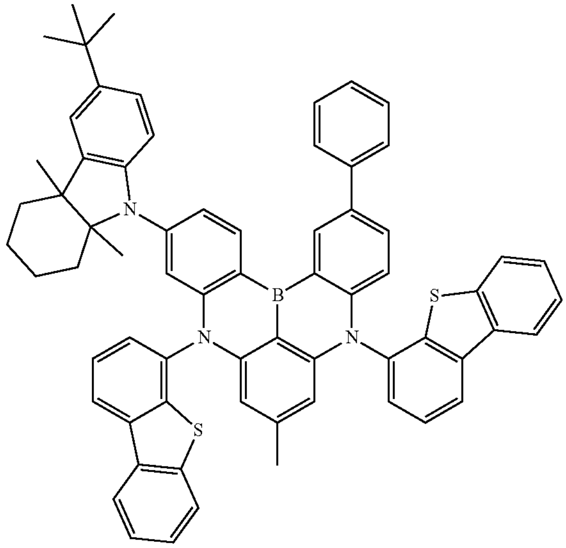
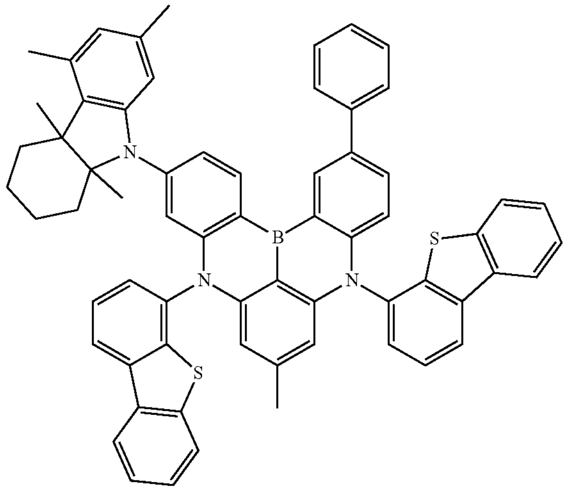

-continued
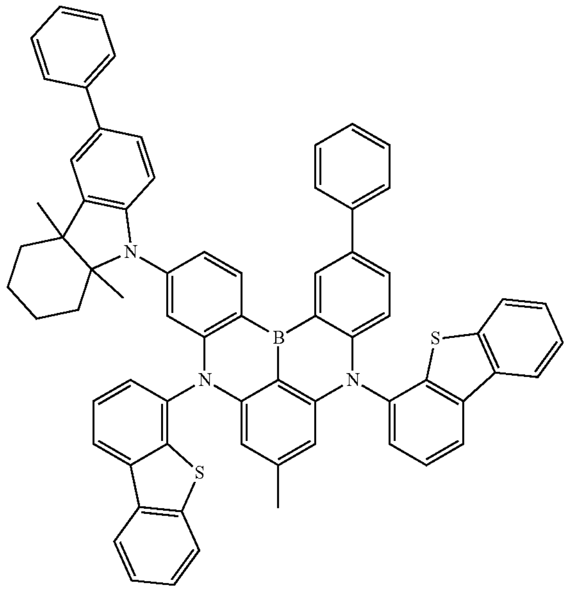
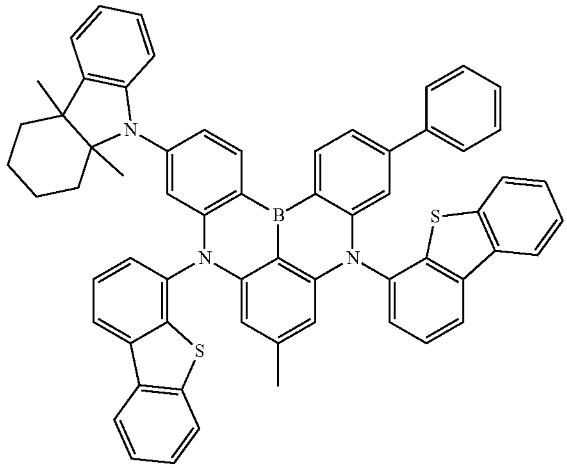
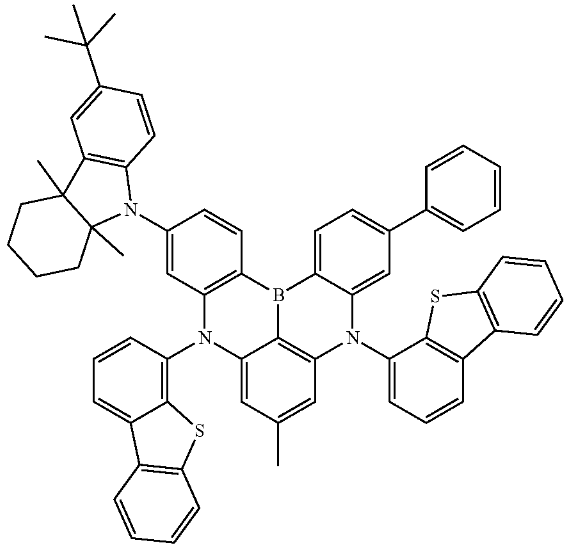
-continued
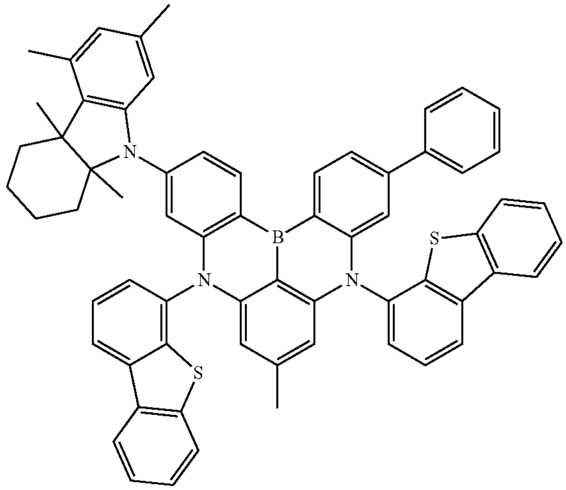
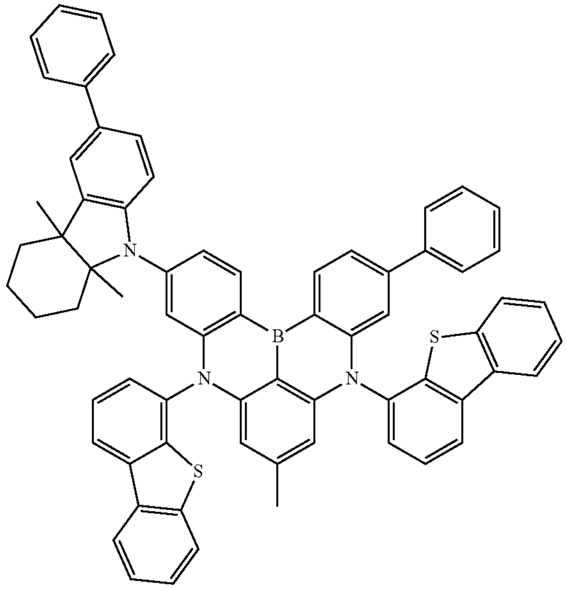
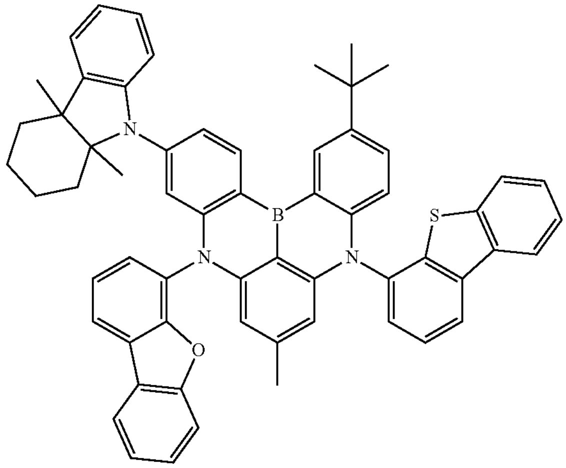

-continued
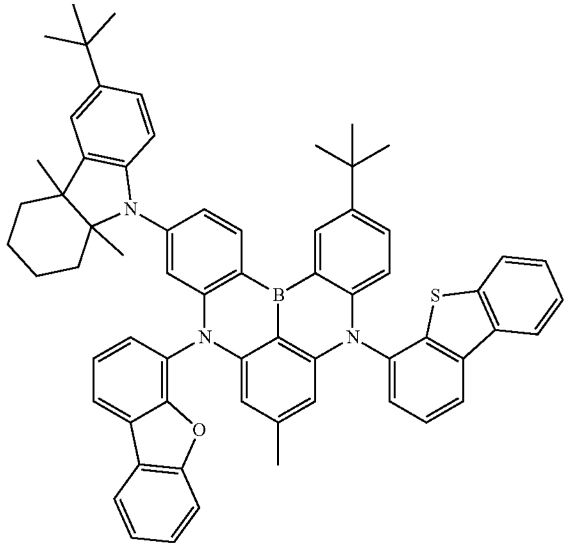
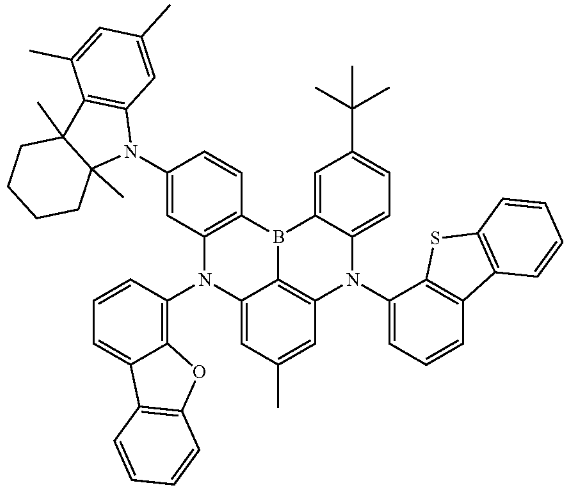
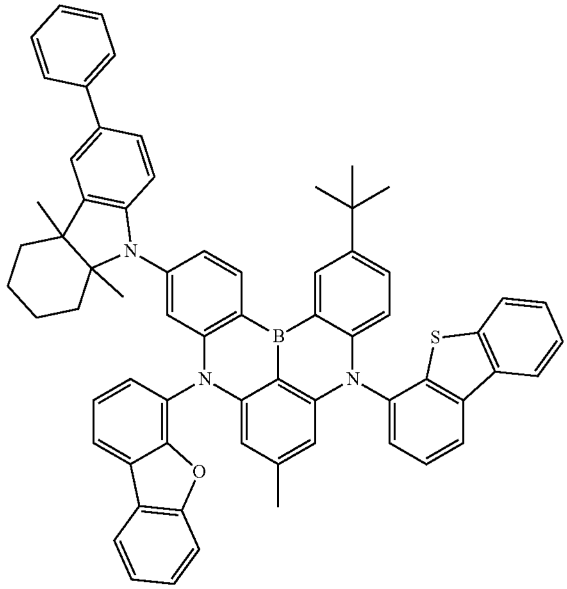
-continued
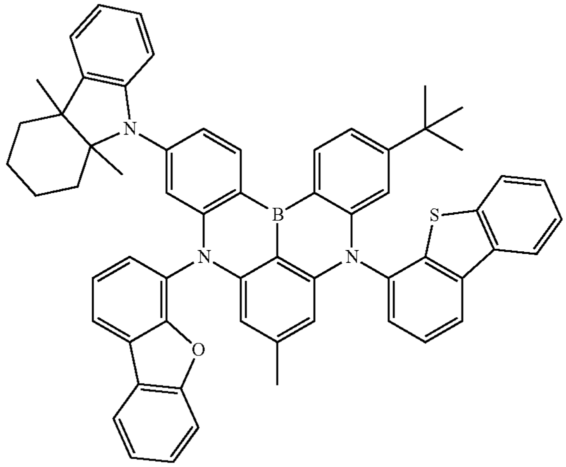
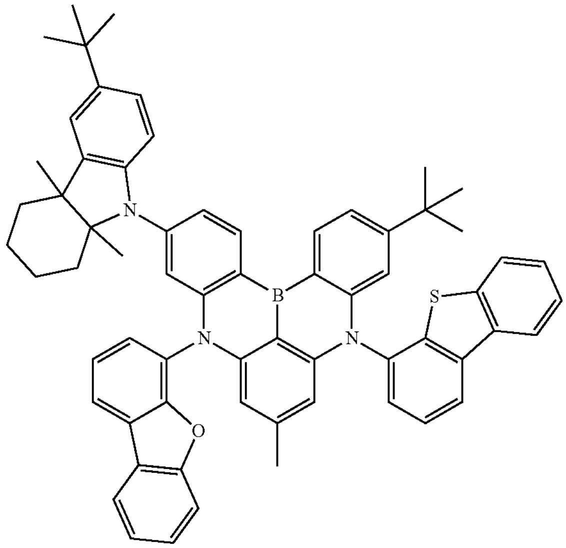
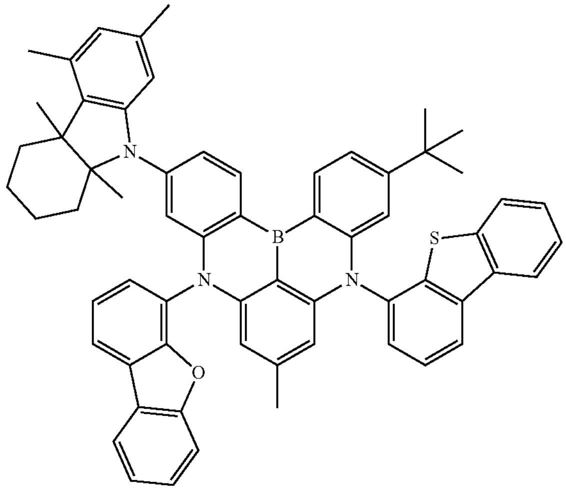

-continued
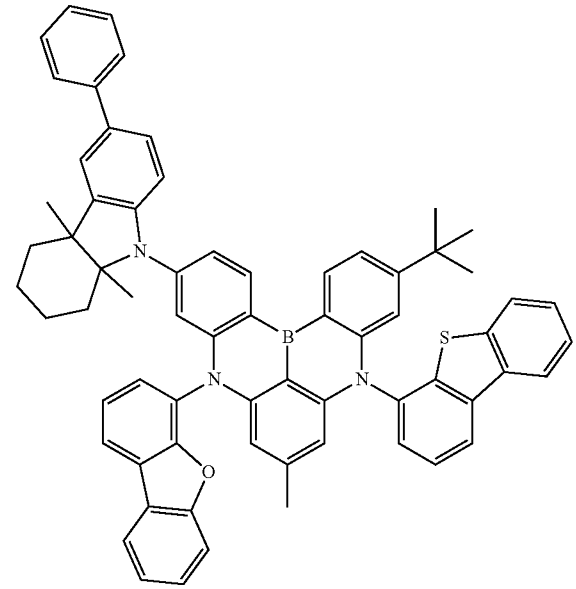
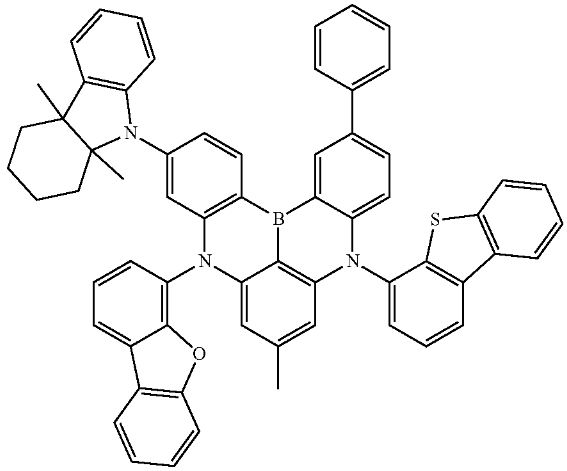
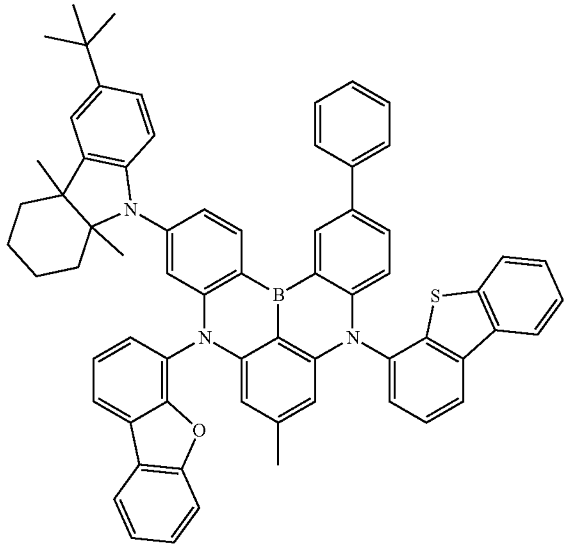
-continued
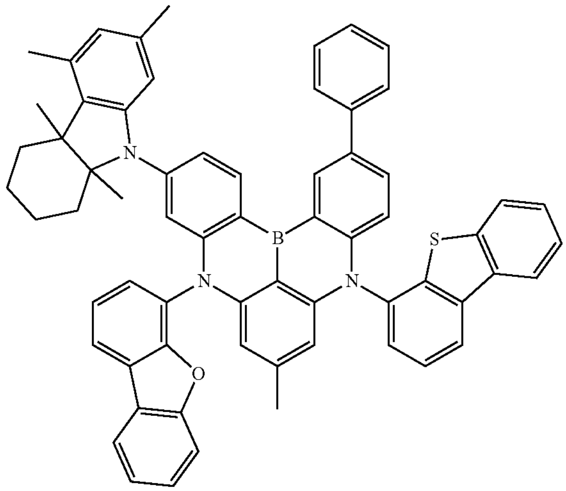
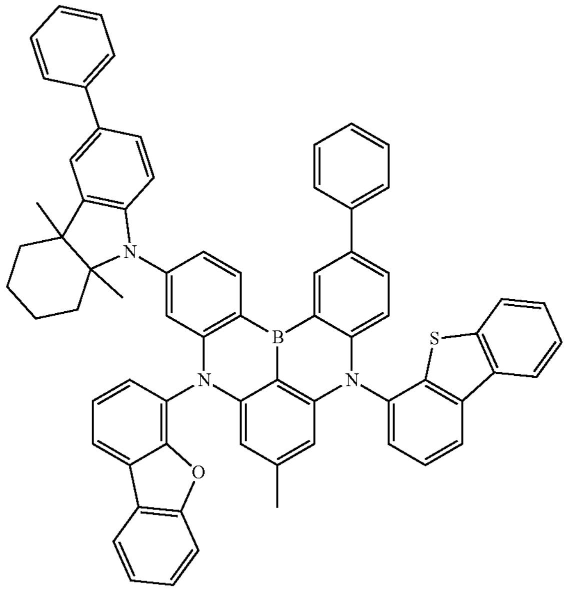
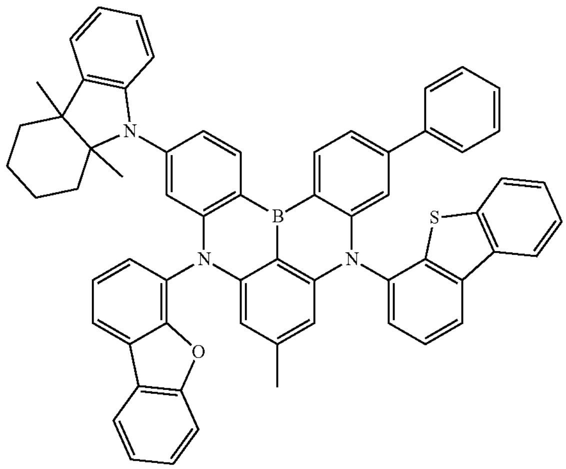

-continued
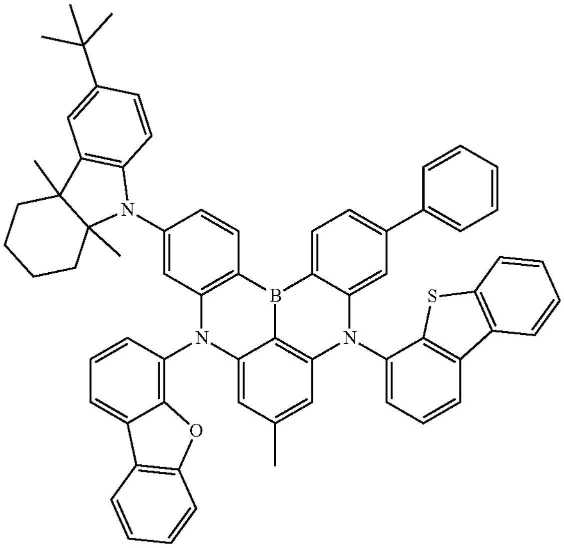
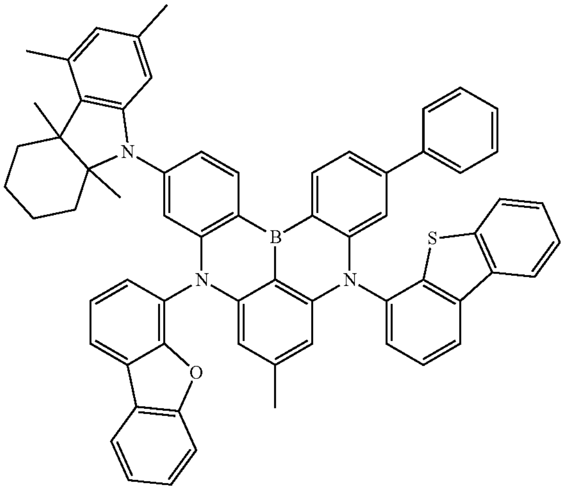
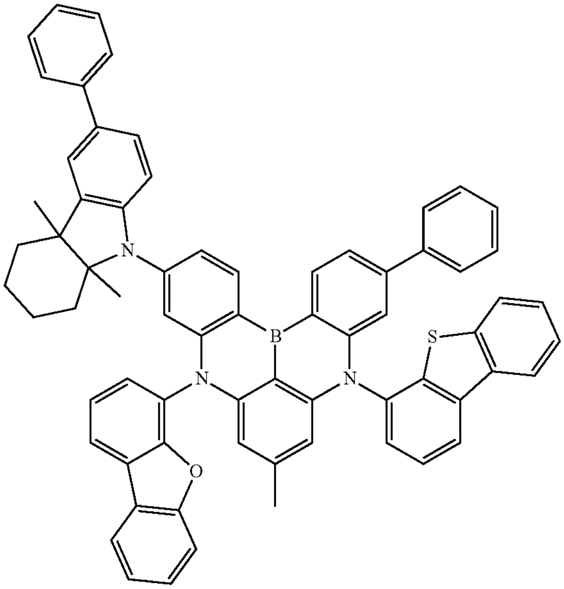
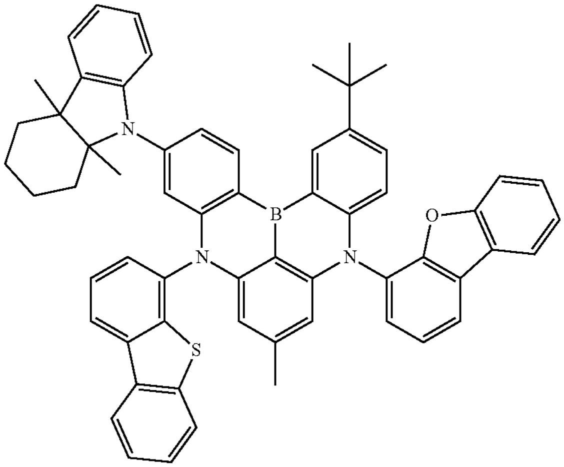
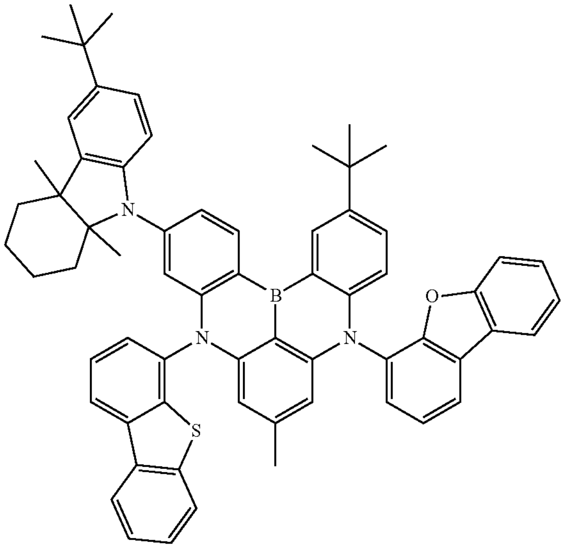
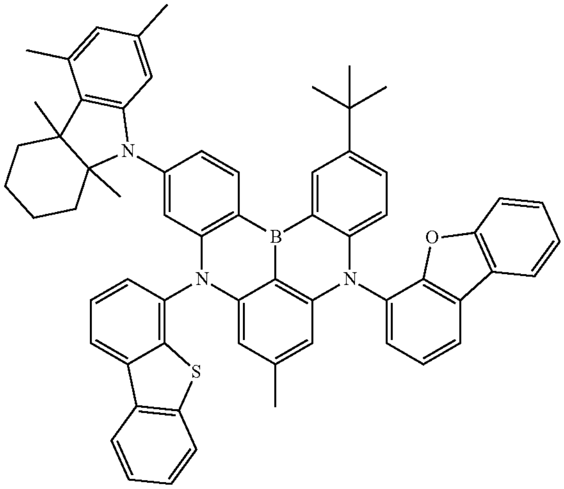

-continued
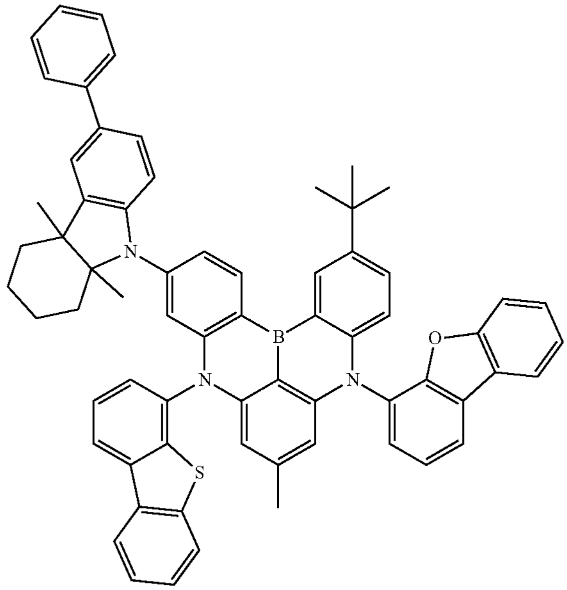
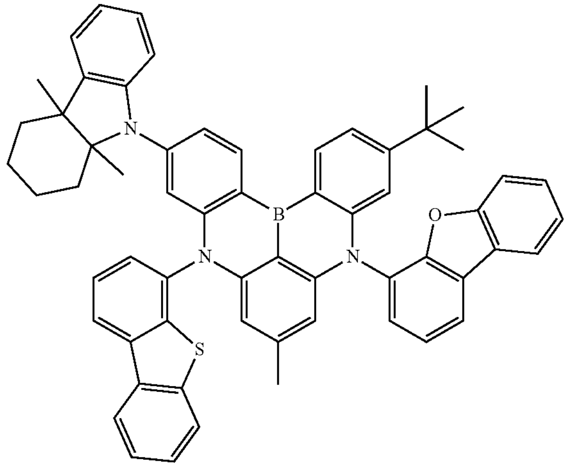
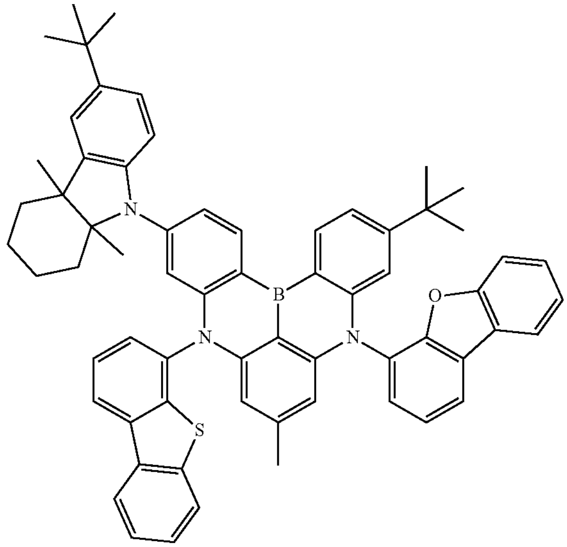
-continued
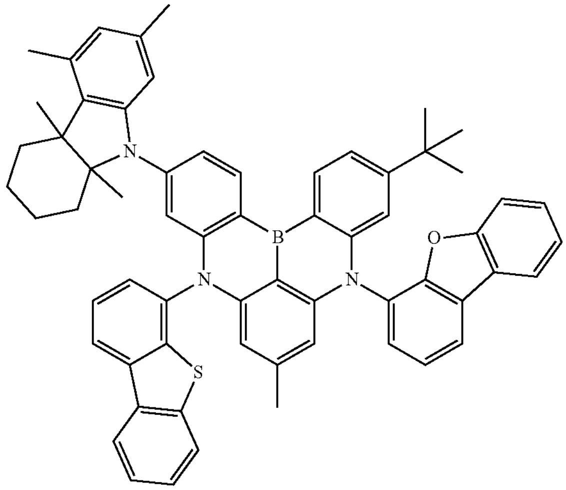
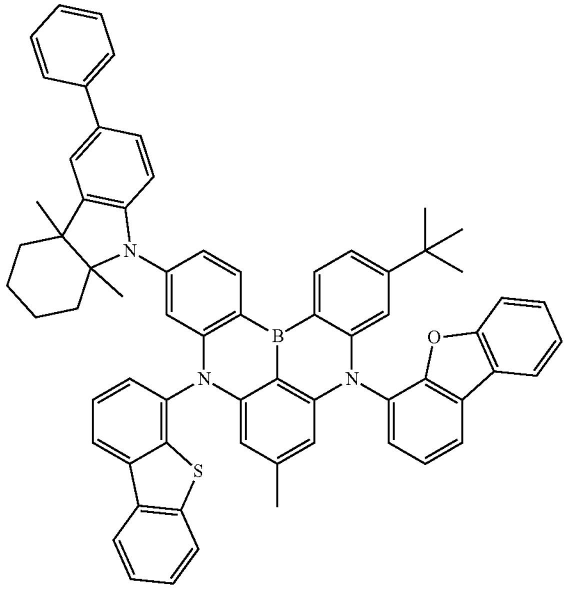
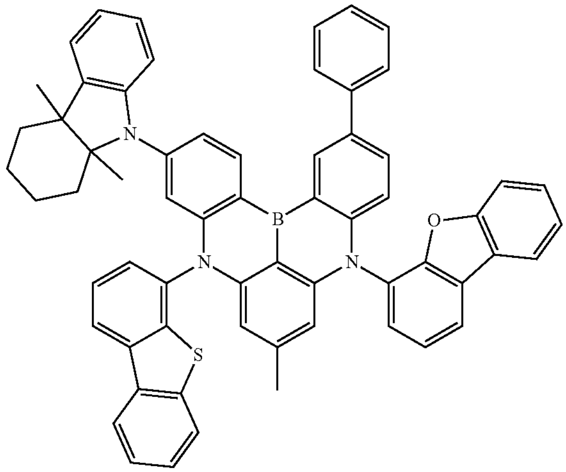

-continued
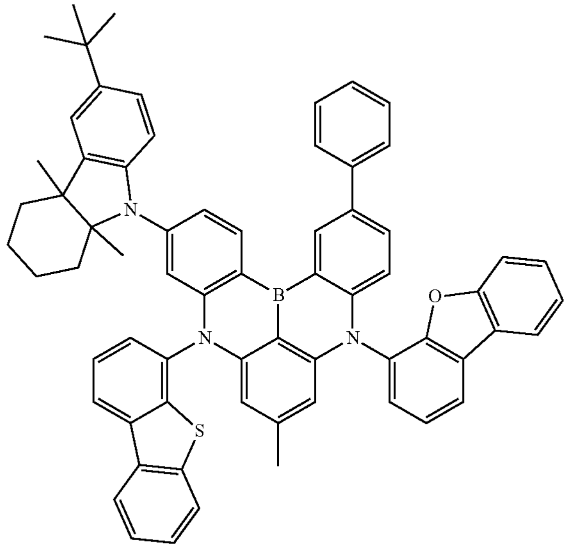
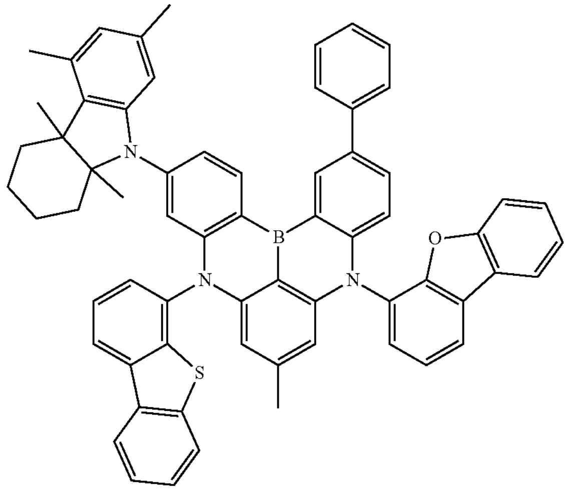
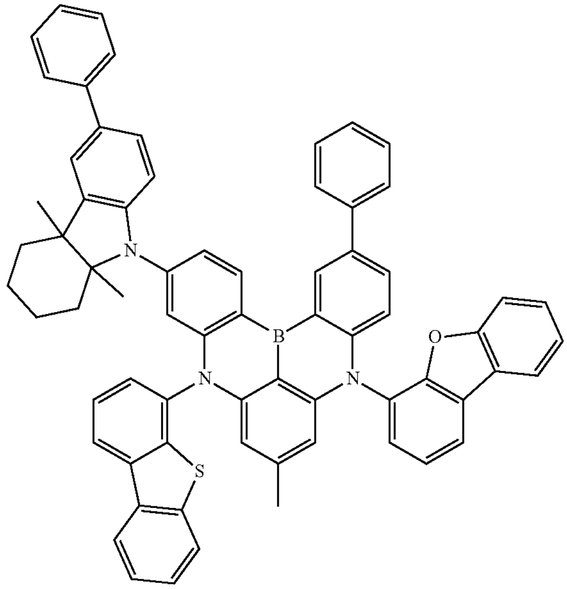
-continued
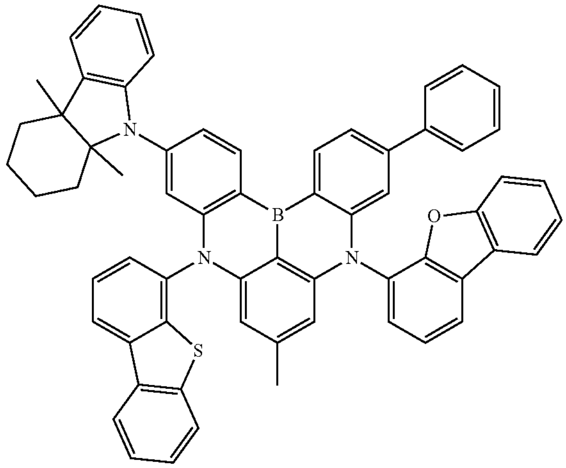
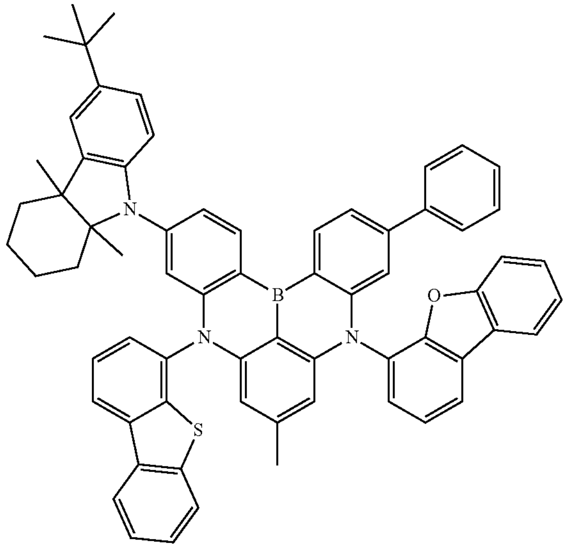
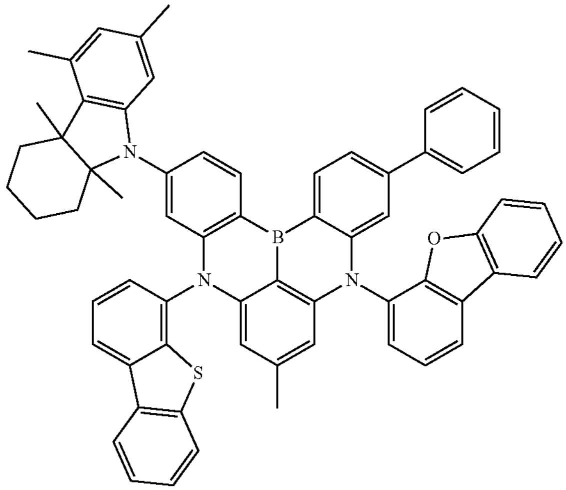

-continued
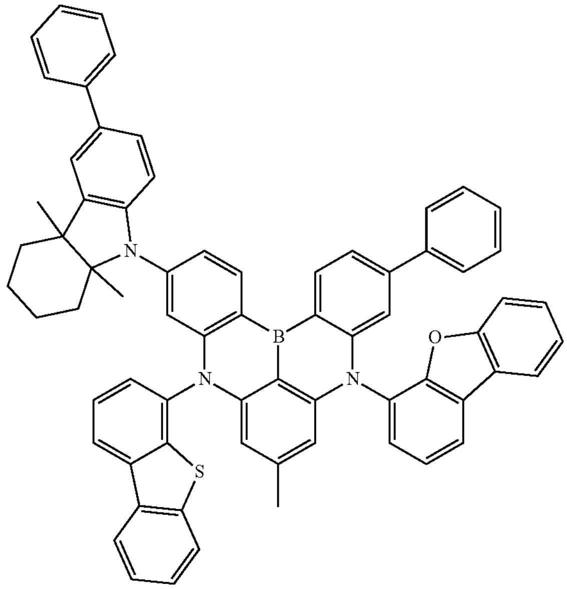 [SMILES: Cc1cc2c3c(c1)N(c1cccc4c1sc1ccccc14)c1cc(N4c5ccc(-c6ccccc6)cc5C5(C)CCCCC45C)ccc1B3c1ccc(-c3ccccc3)cc1N2c1cccc2c1oc1ccccc12]
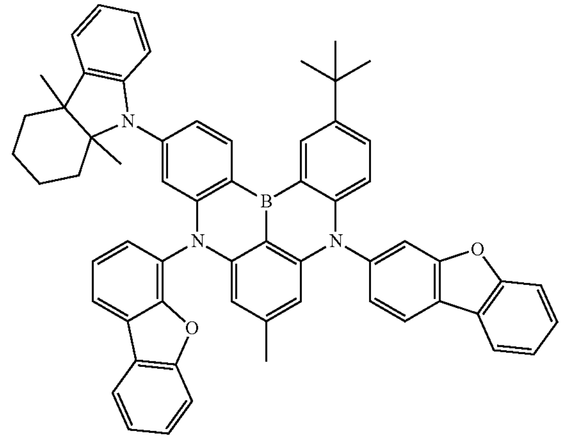
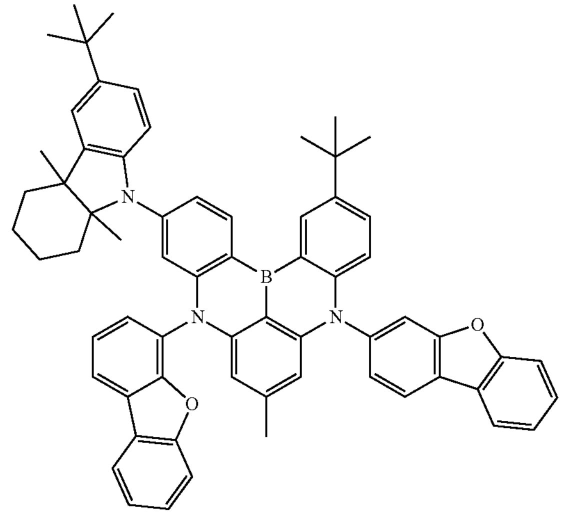
-continued
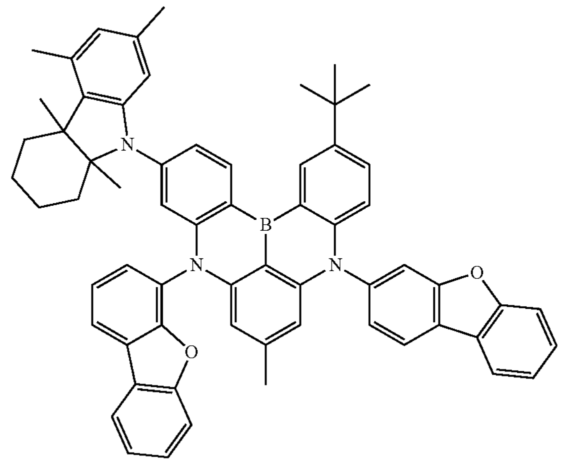
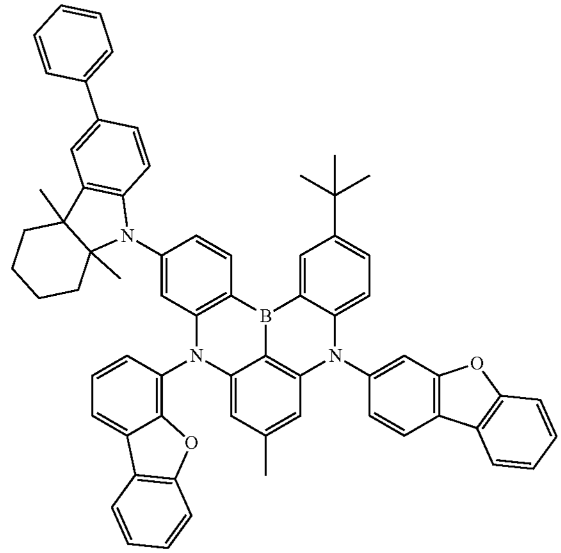
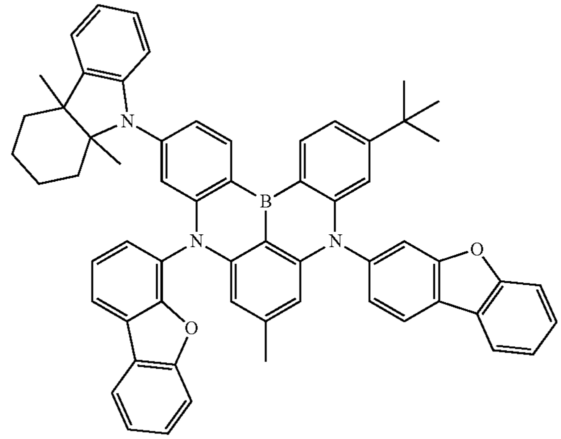

-continued
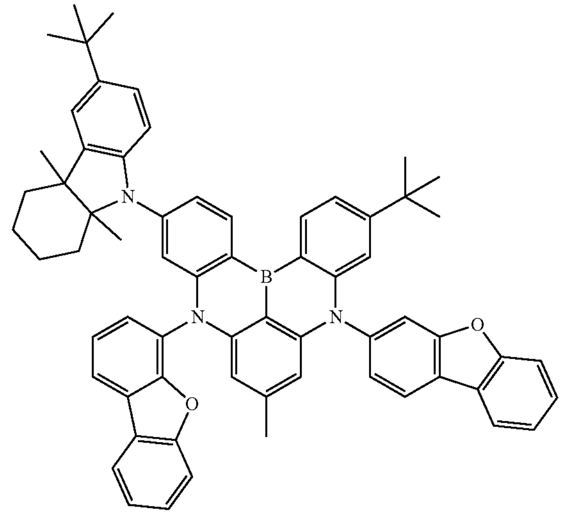
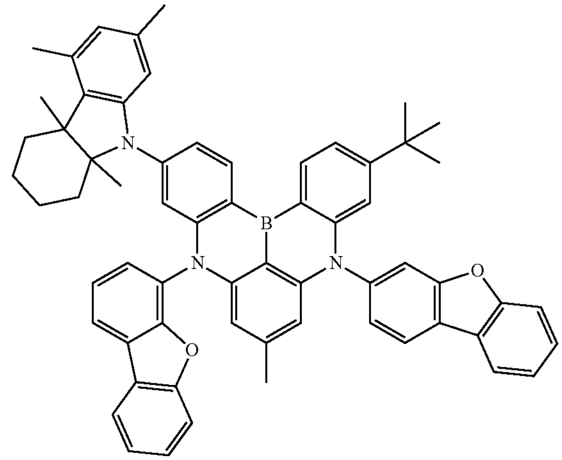
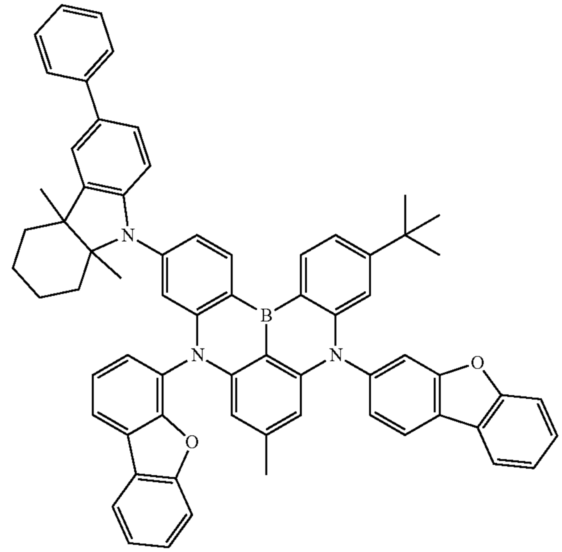
-continued
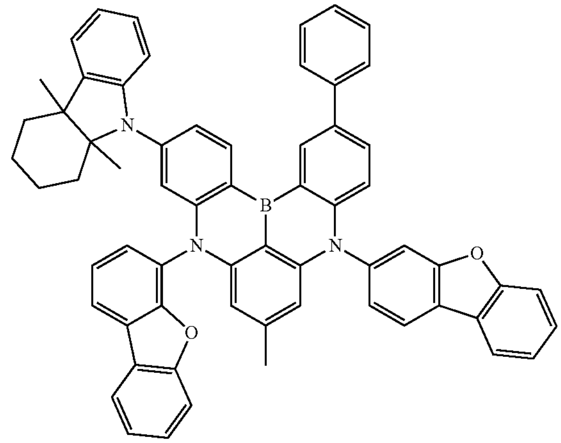
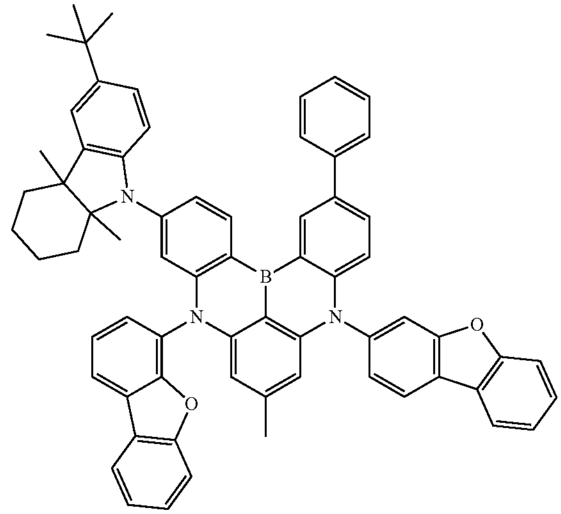
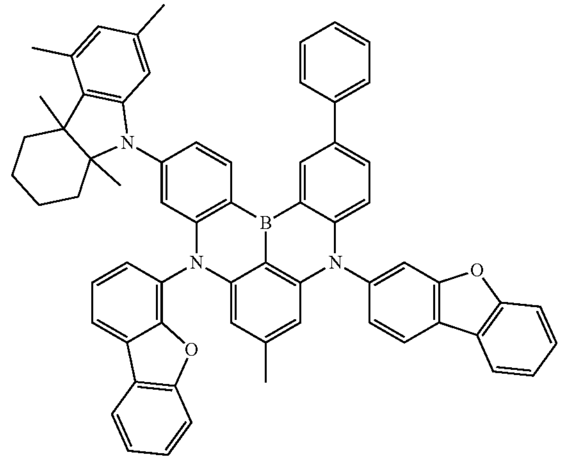

-continued
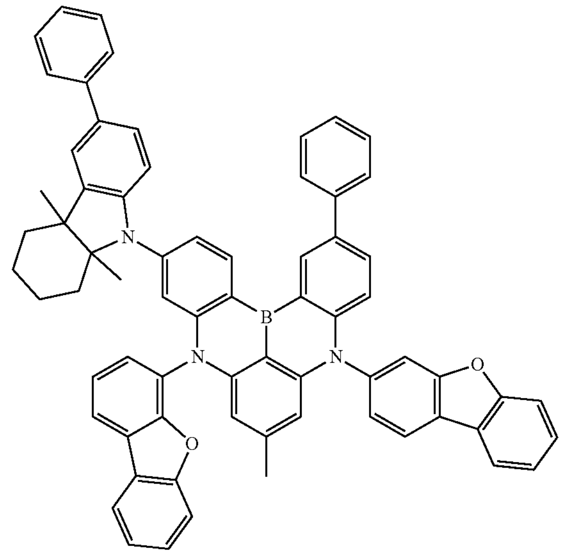
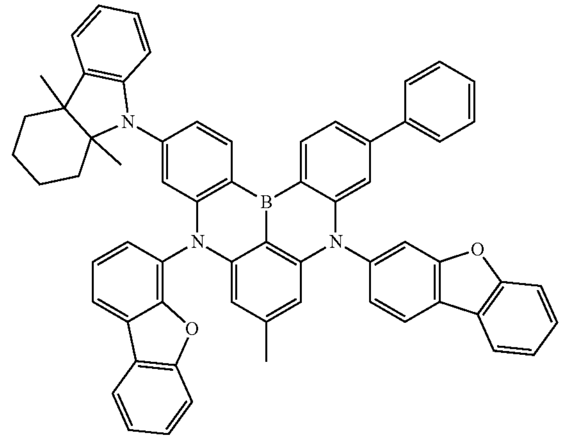
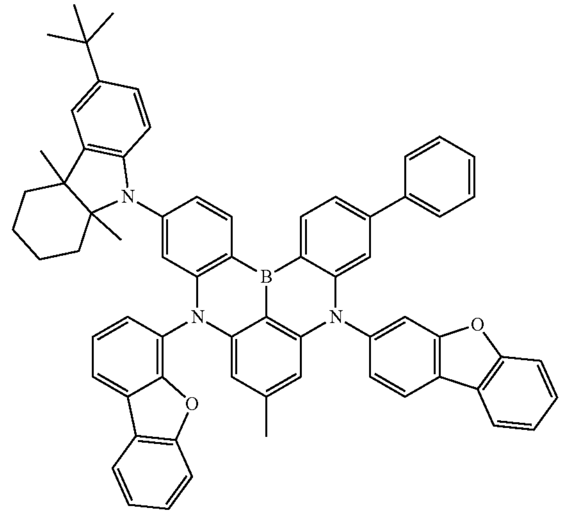
-continued
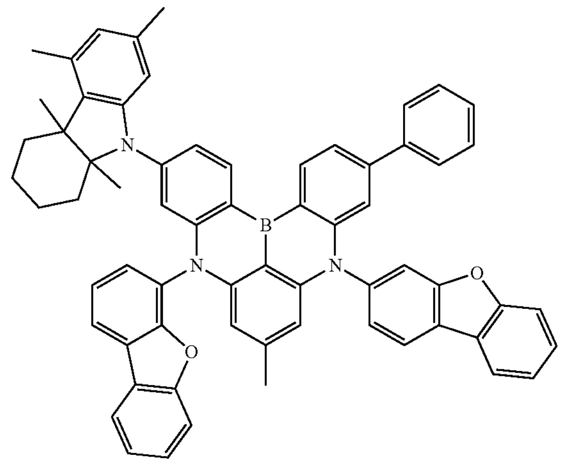
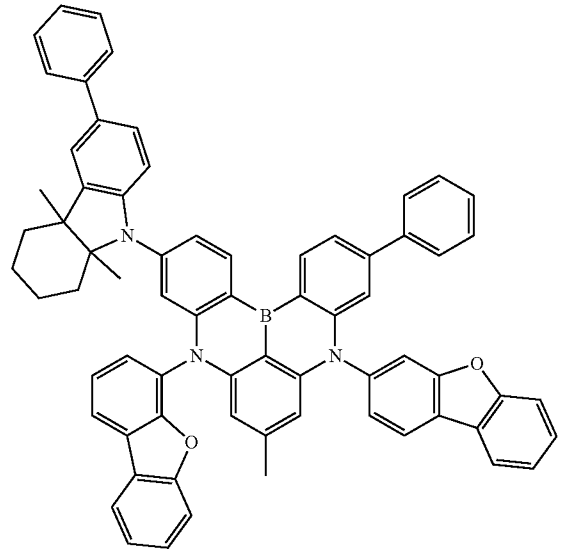
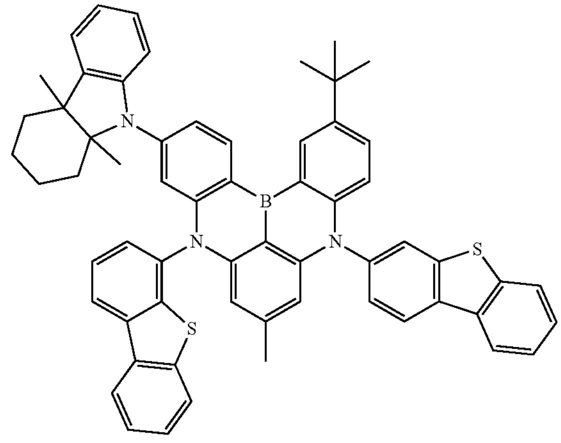

-continued
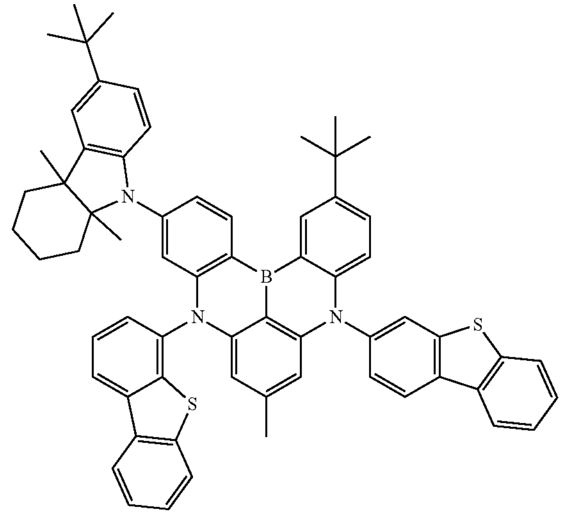
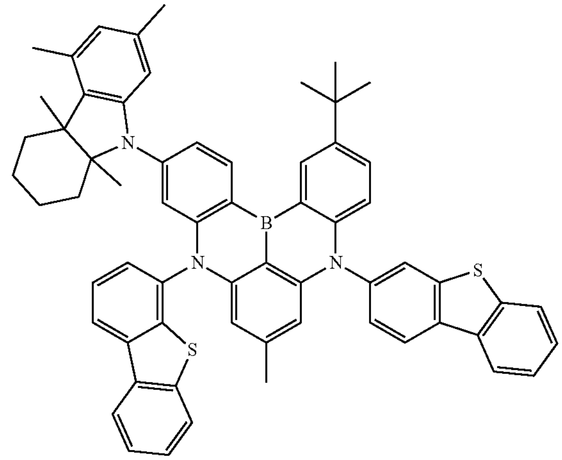
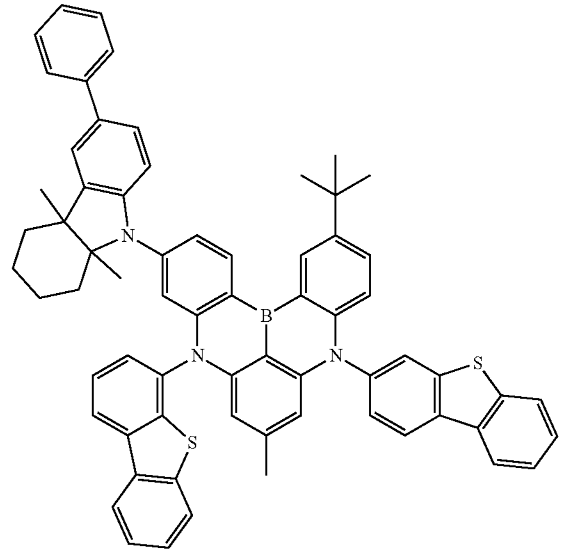
-continued
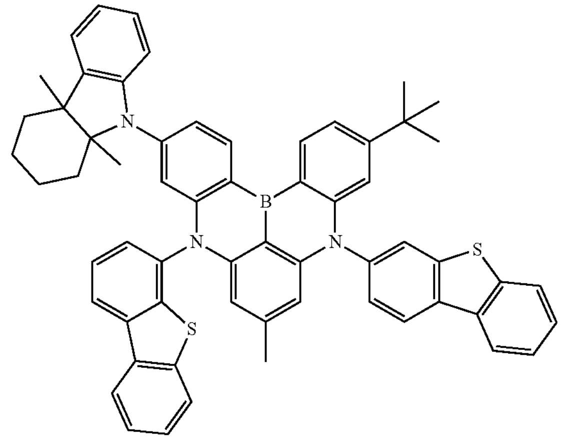
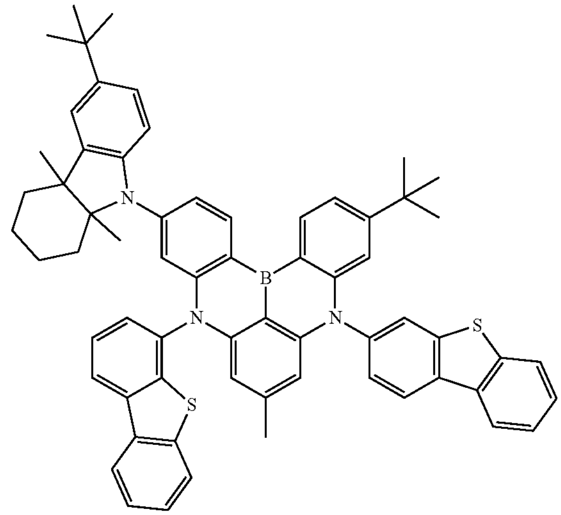
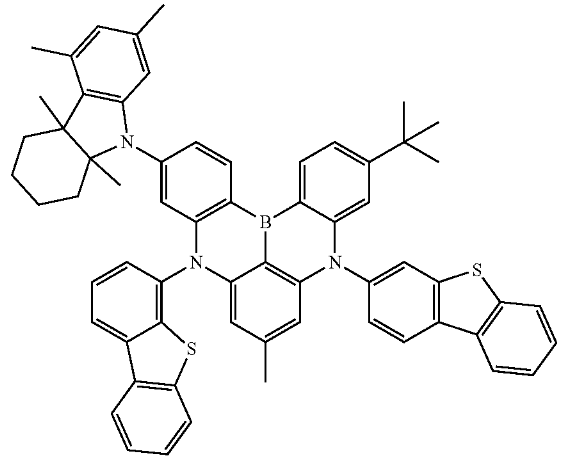

-continued
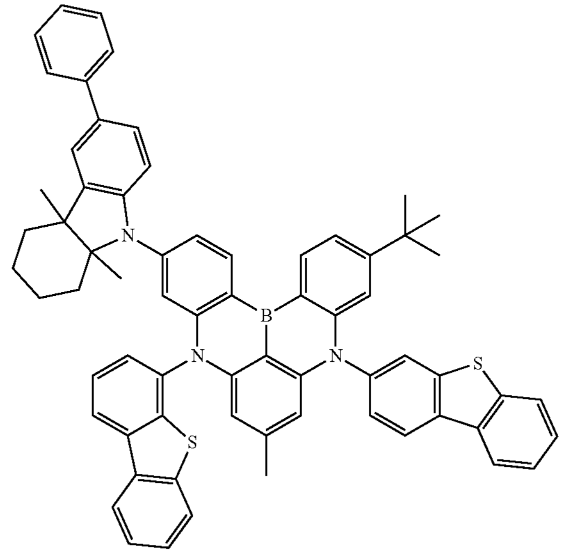
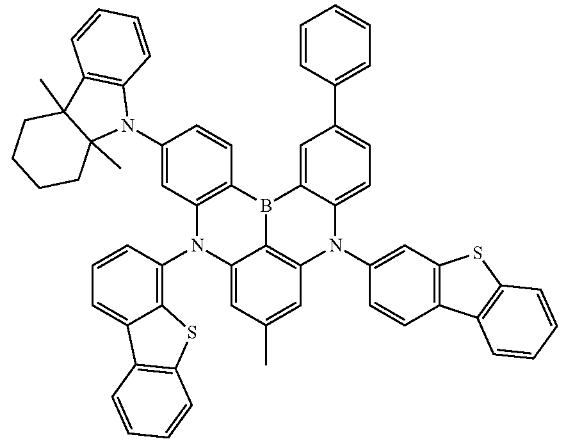
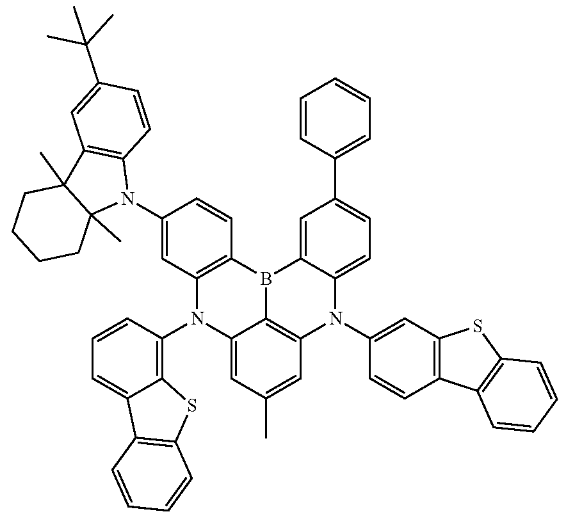
-continued
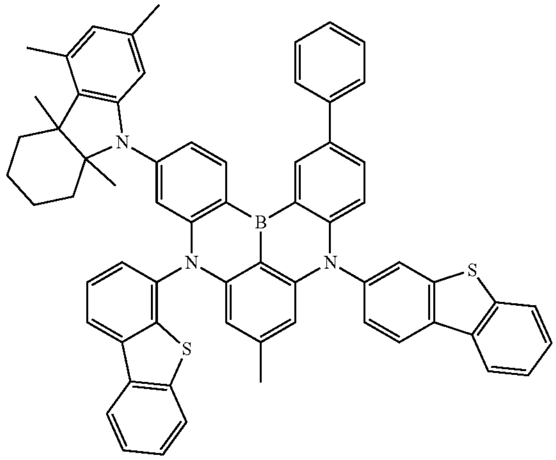
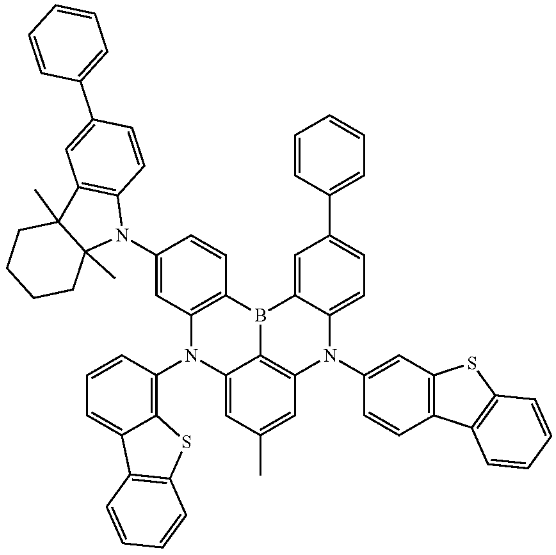
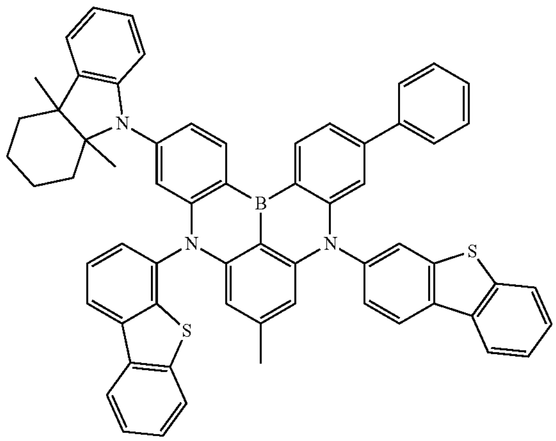

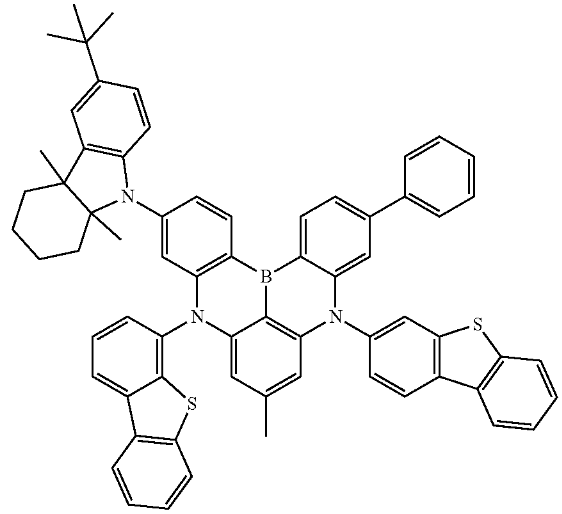
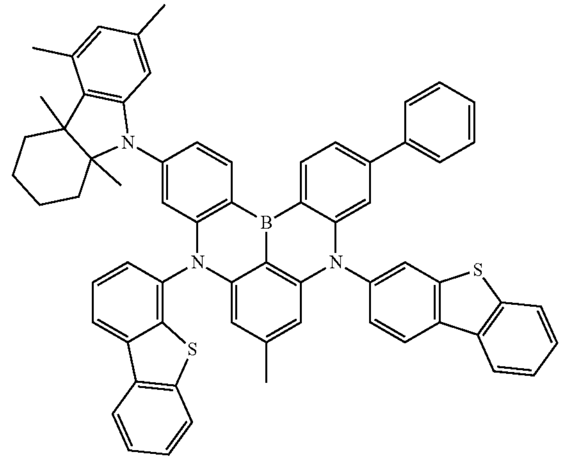
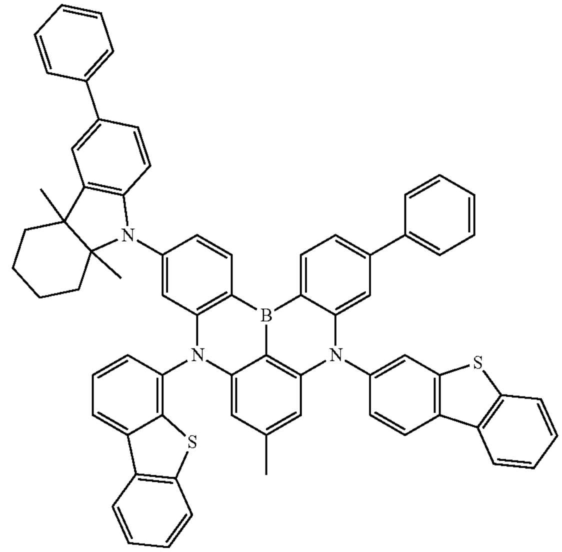
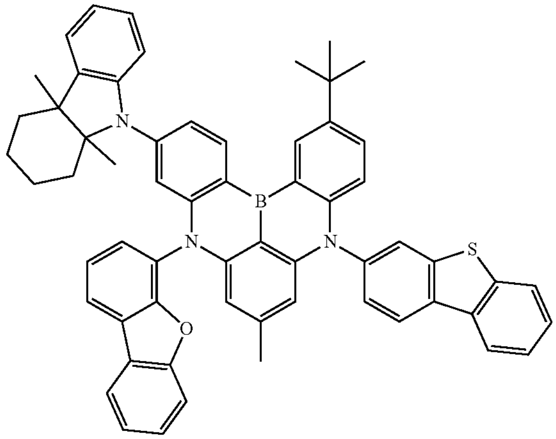
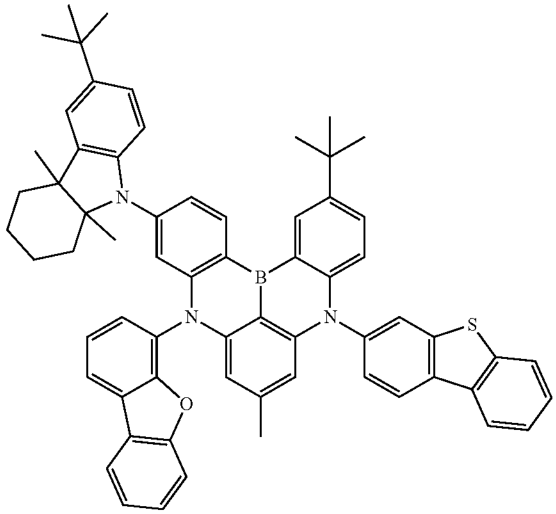
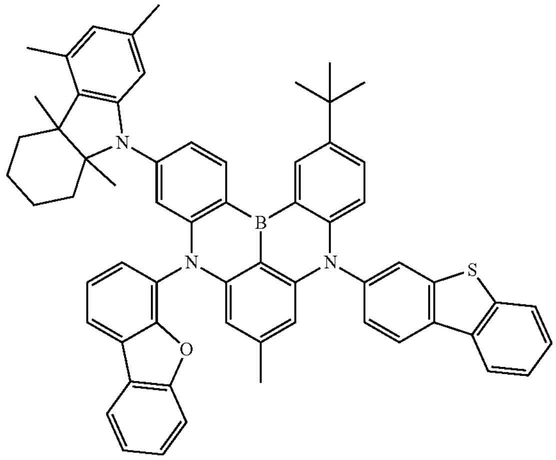

-continued
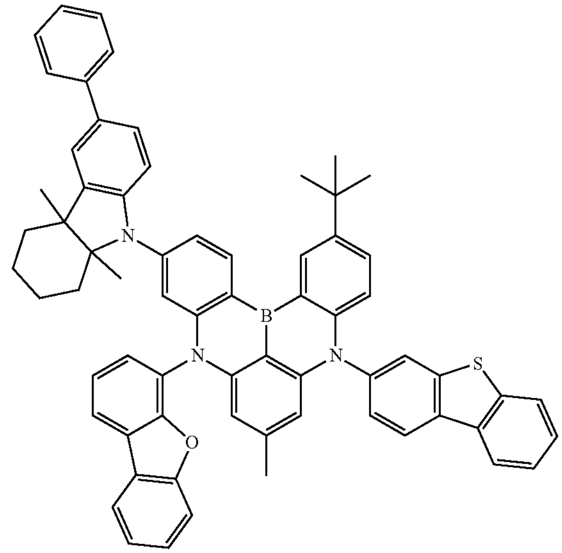
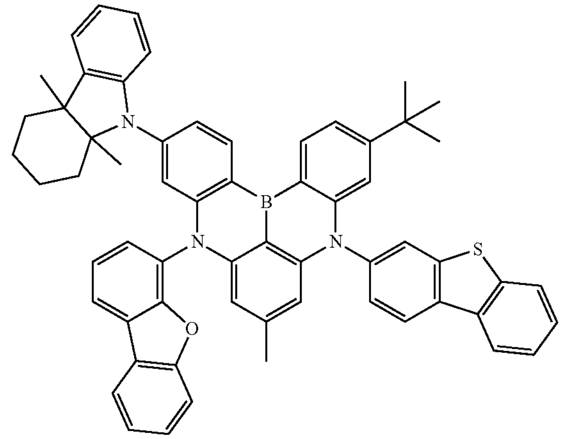
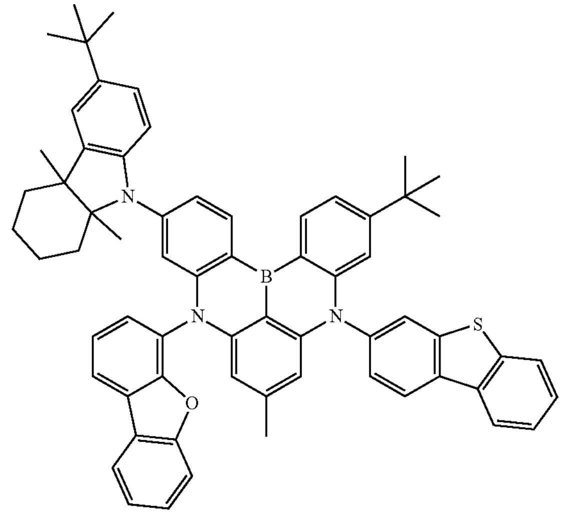
-continued
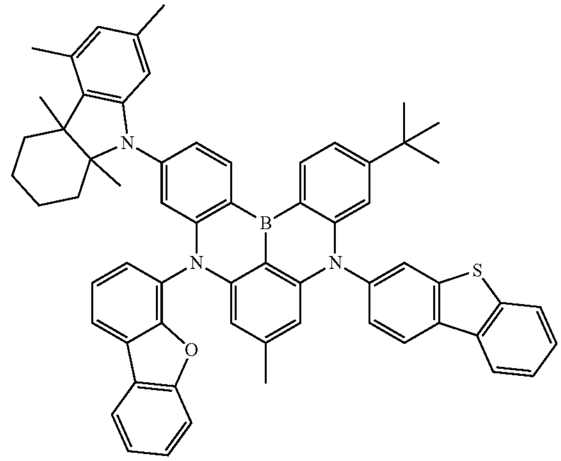
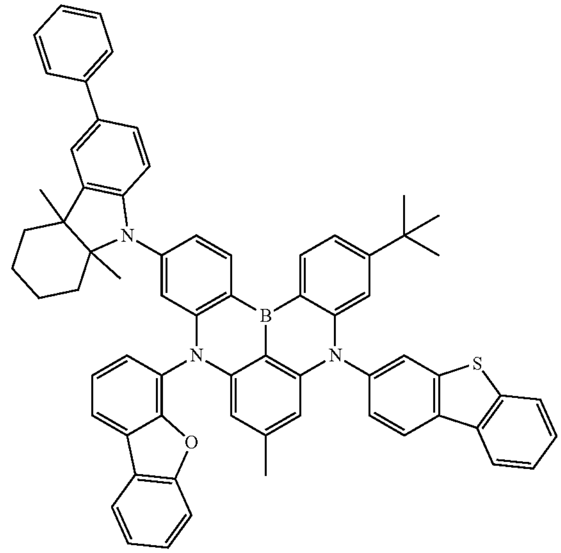
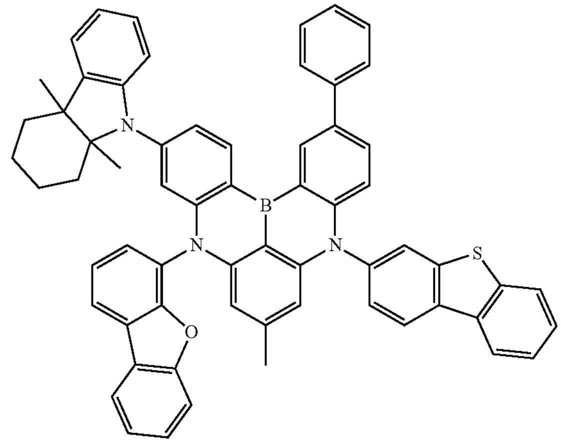

-continued
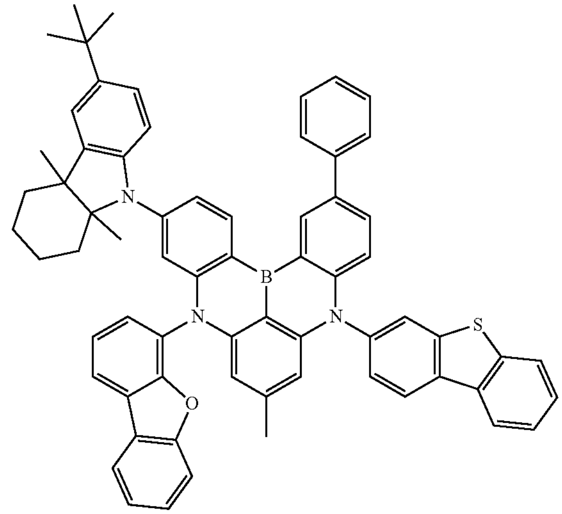
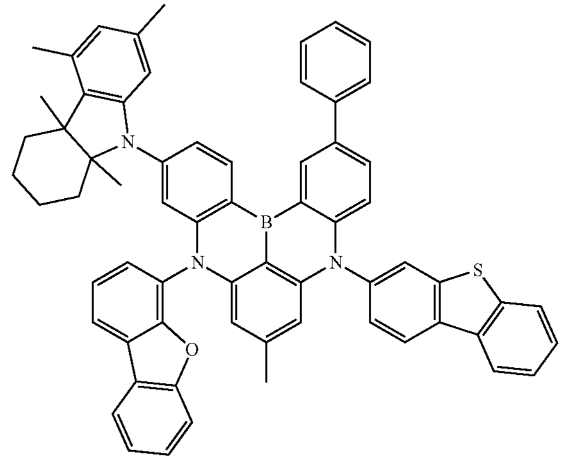
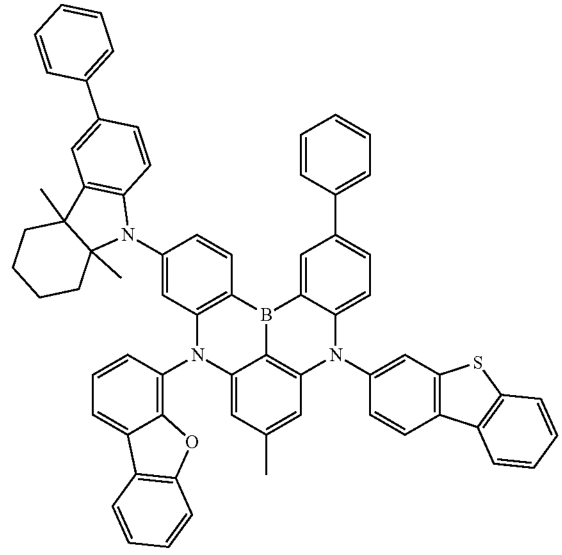
-continued
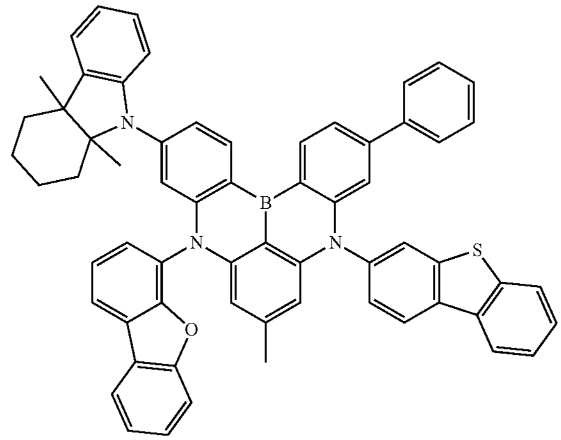
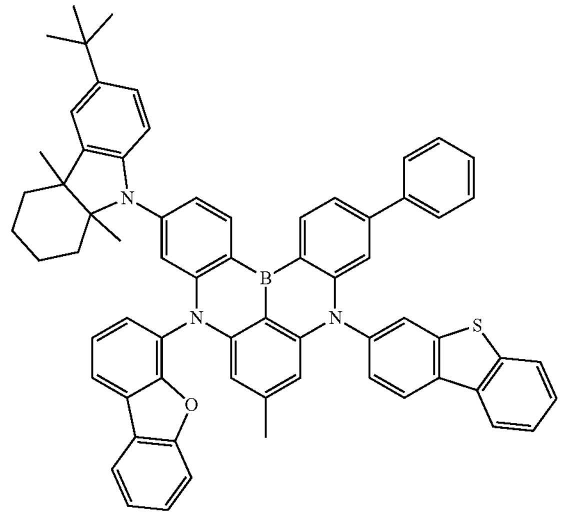
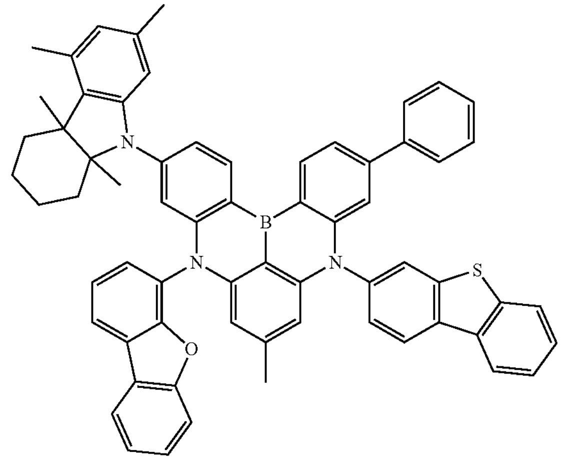

-continued
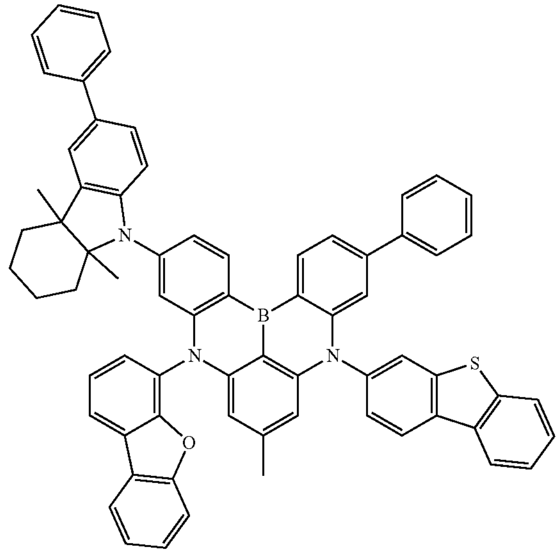
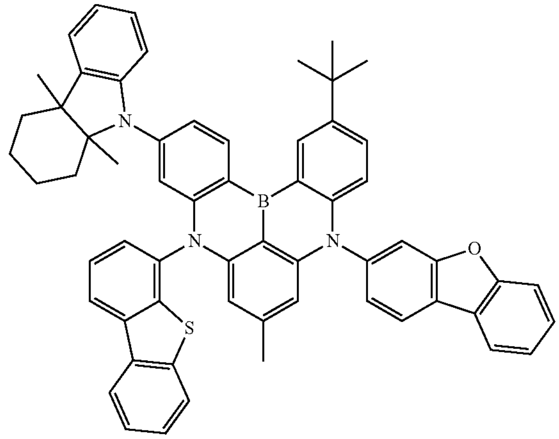
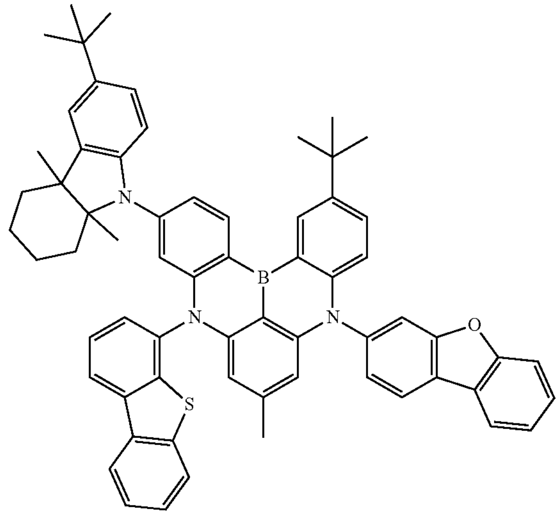
-continued
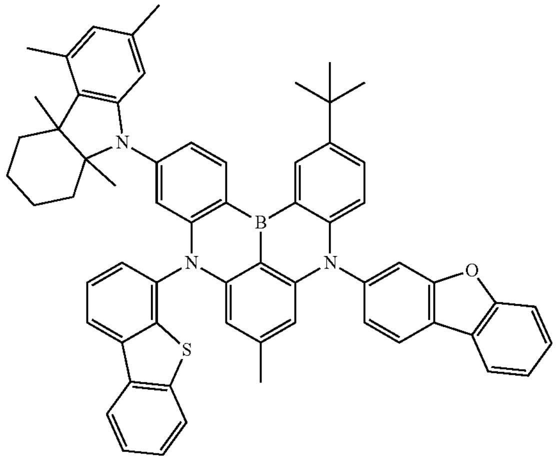
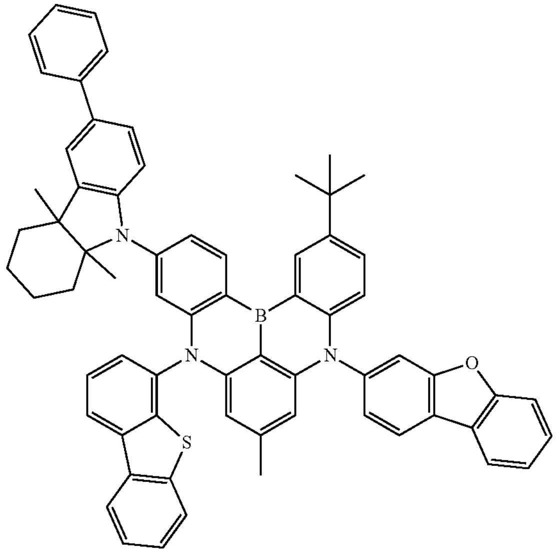
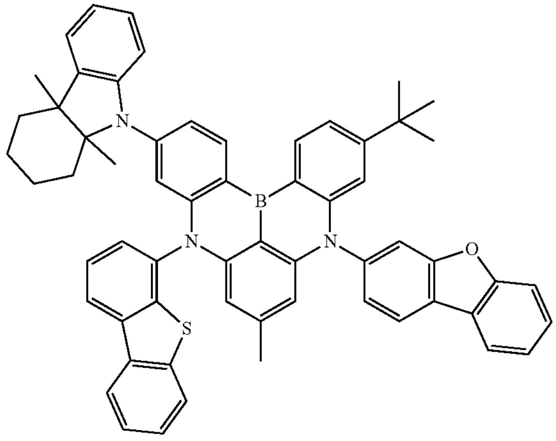

-continued
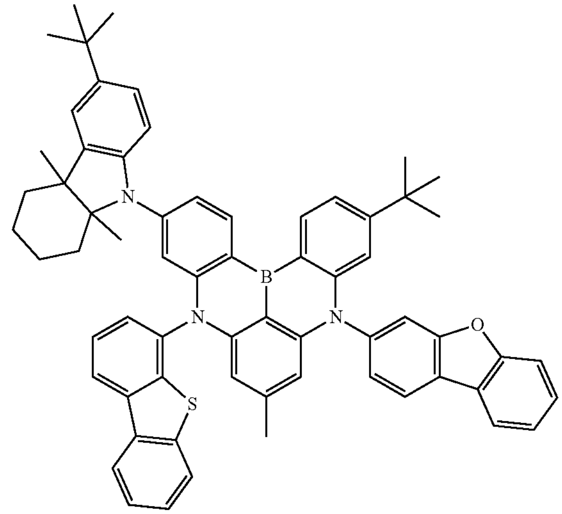
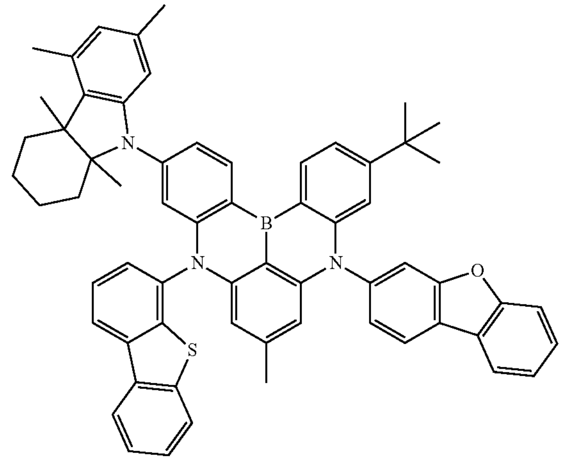
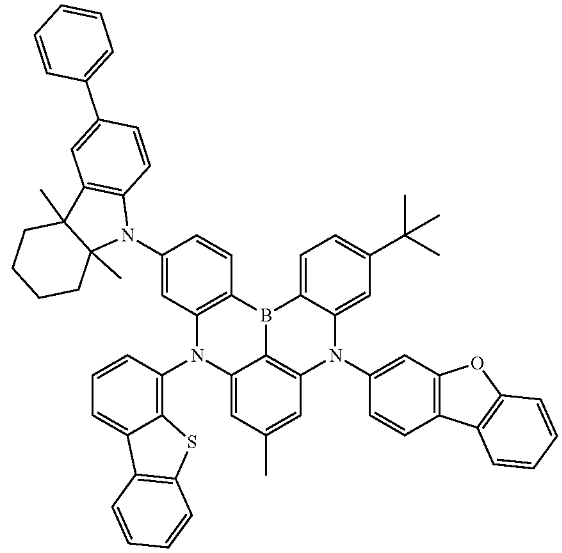
-continued
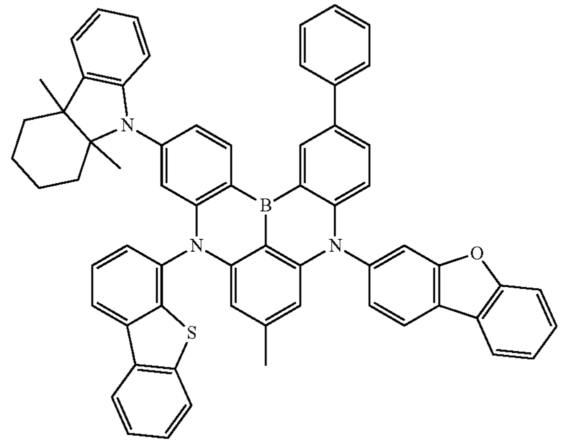
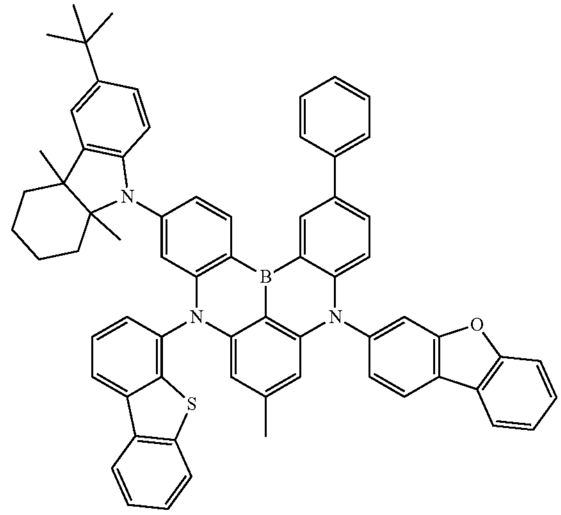
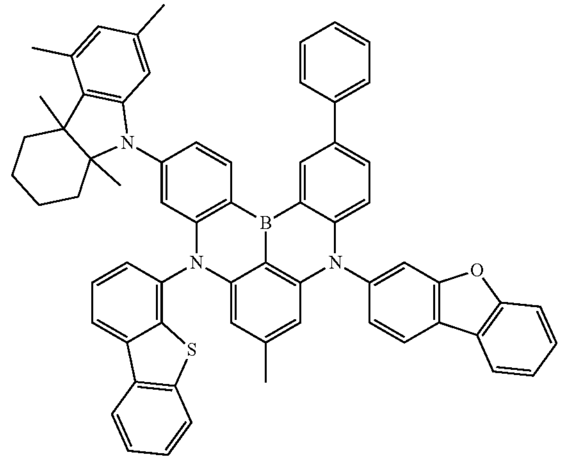

-continued
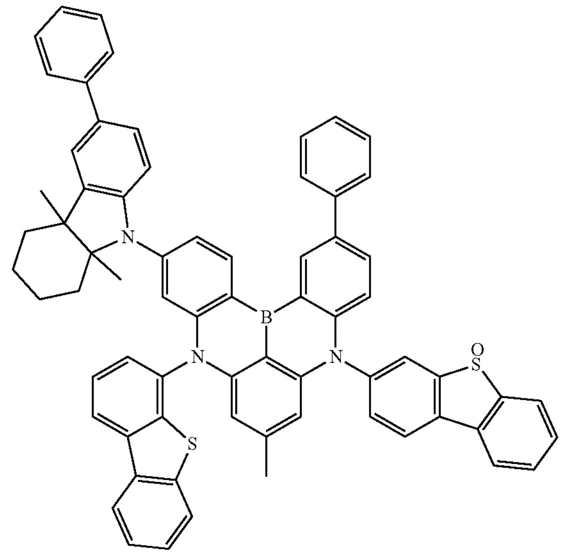
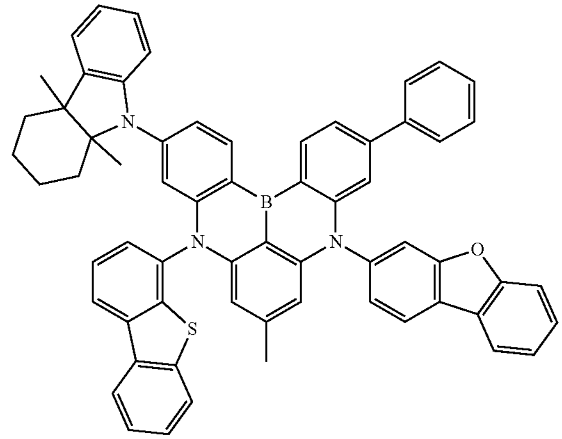
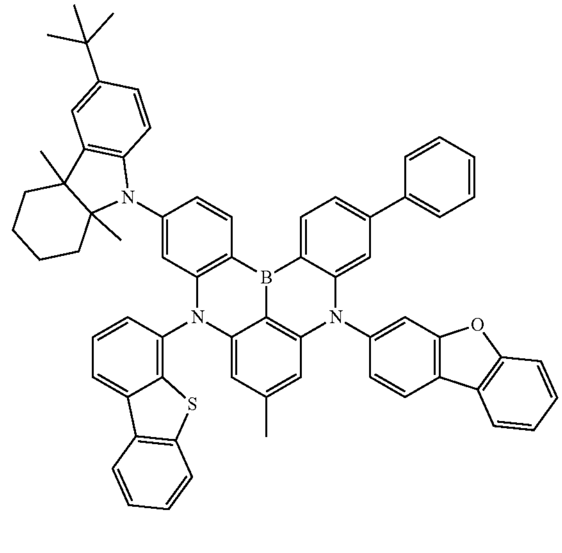
-continued
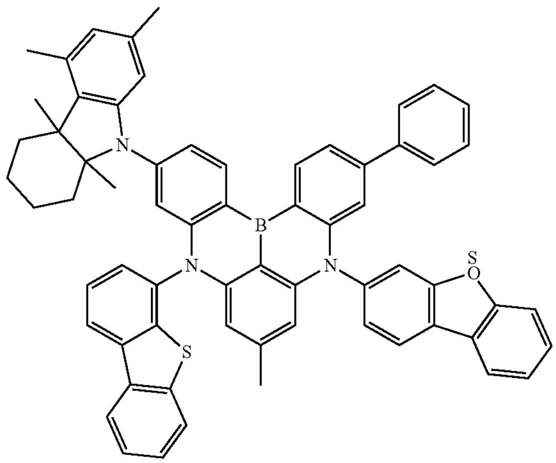
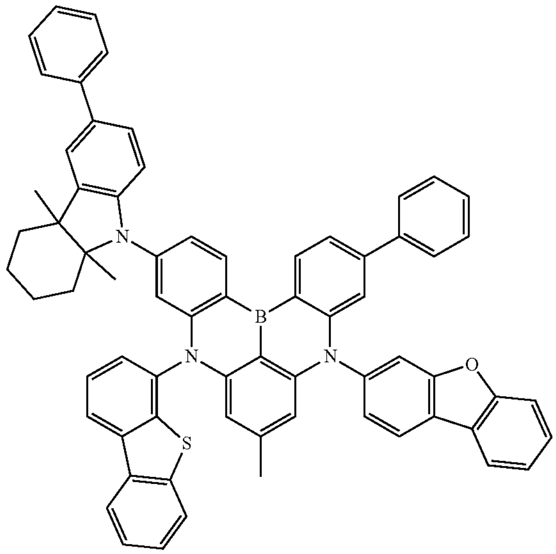
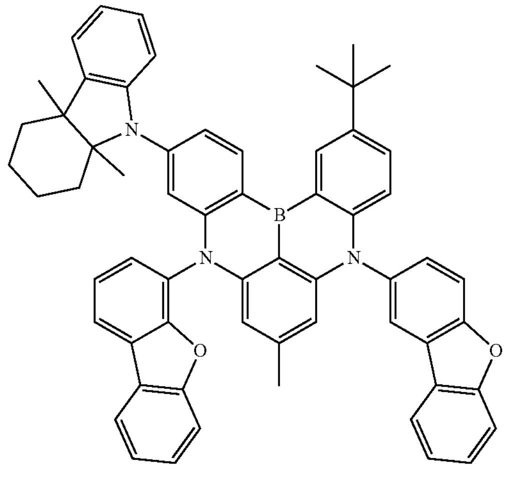

-continued
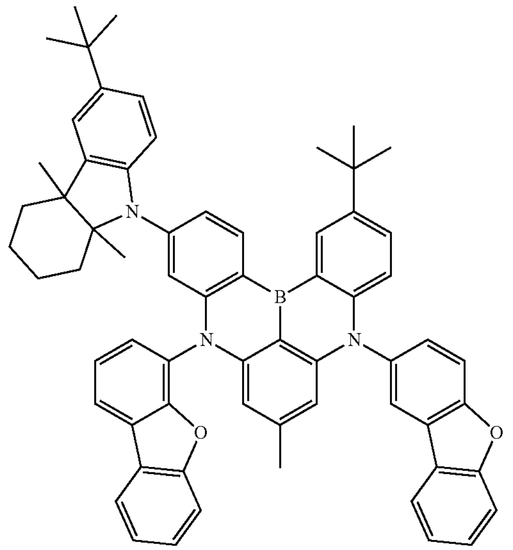
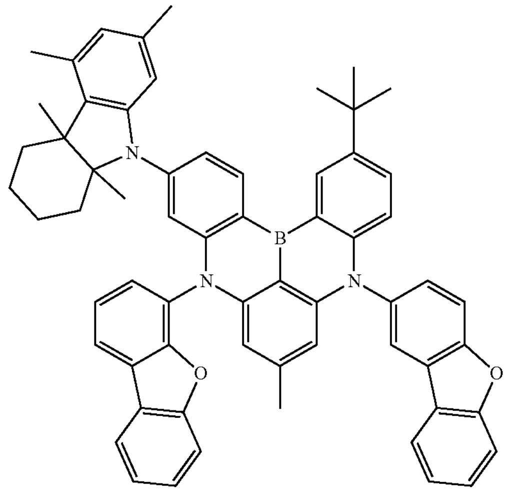
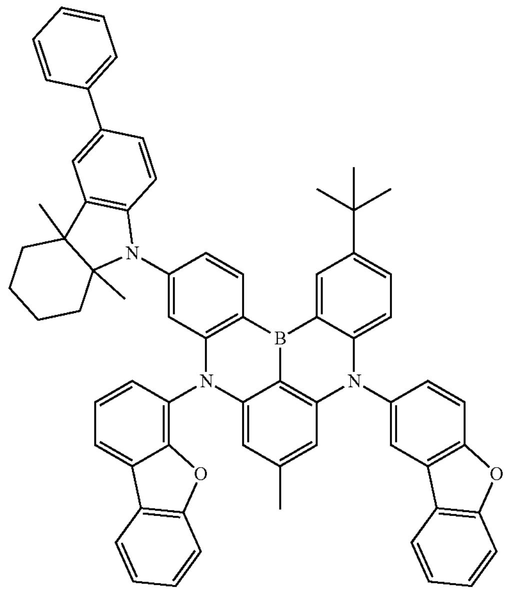
-continued
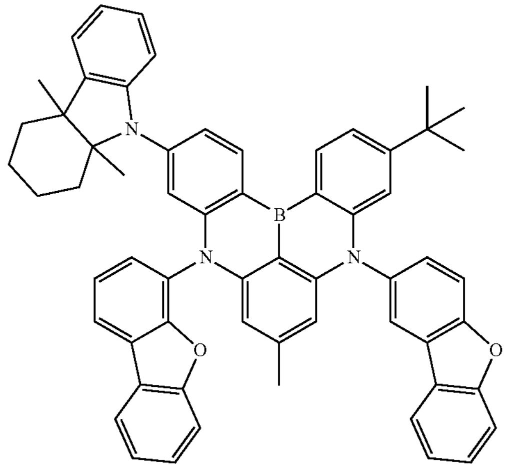
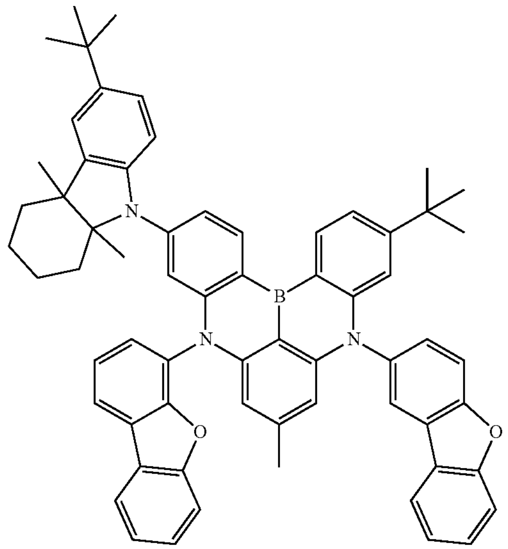
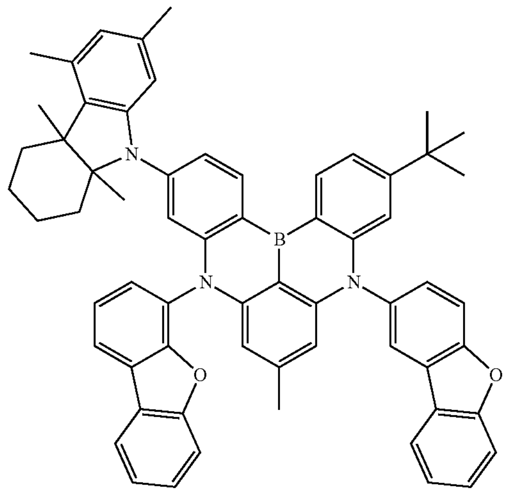

-continued
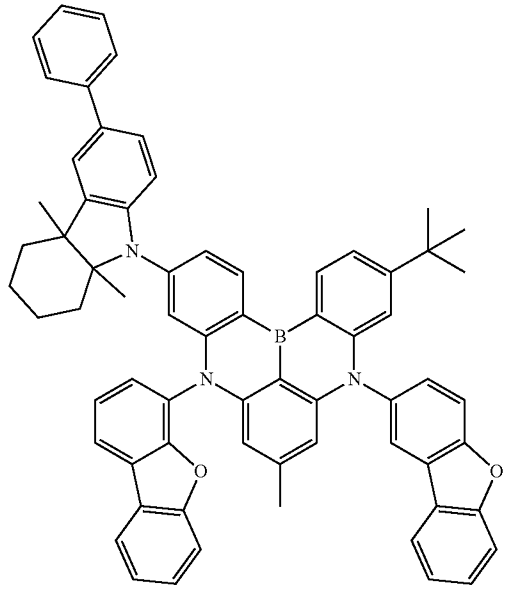
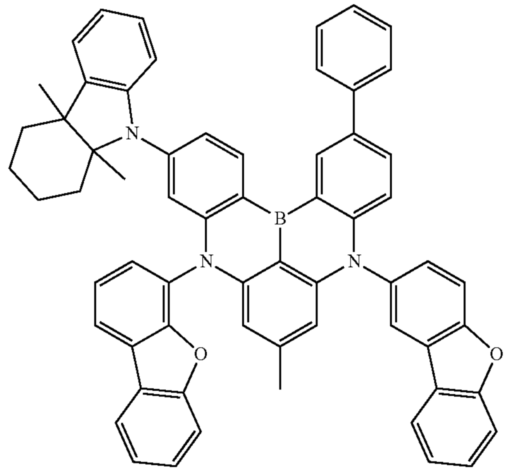
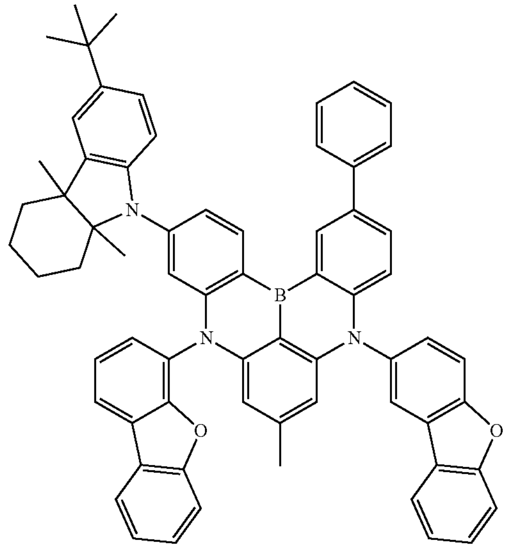
-continued
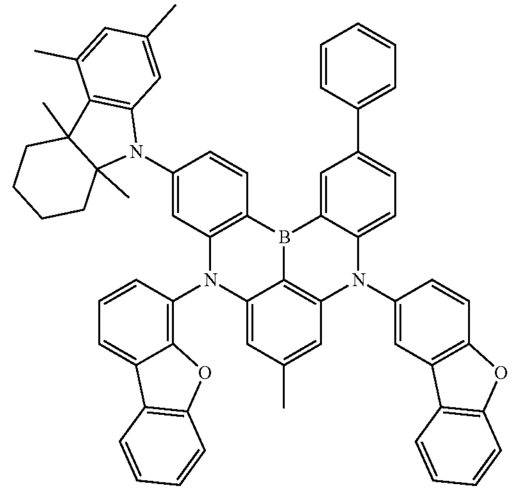
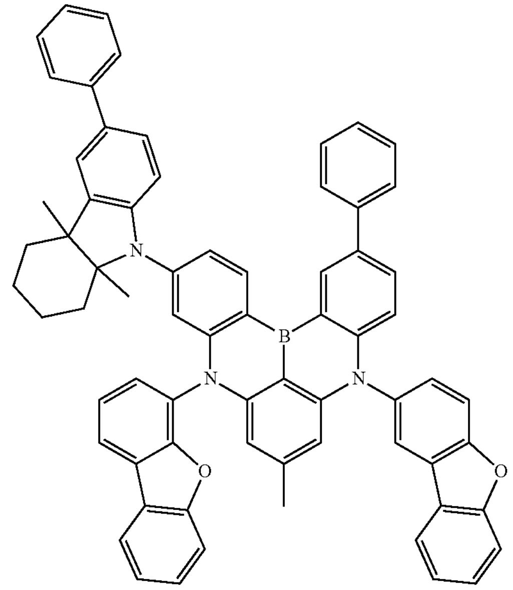
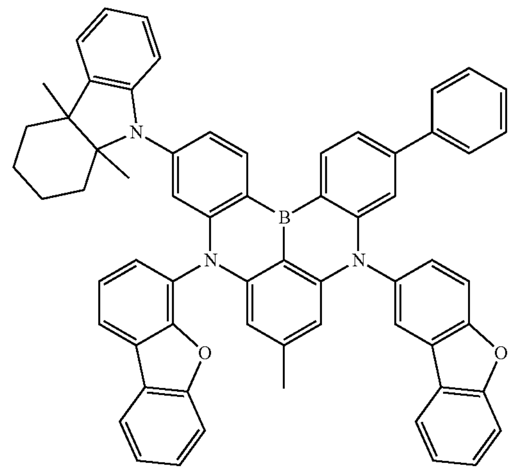

-continued
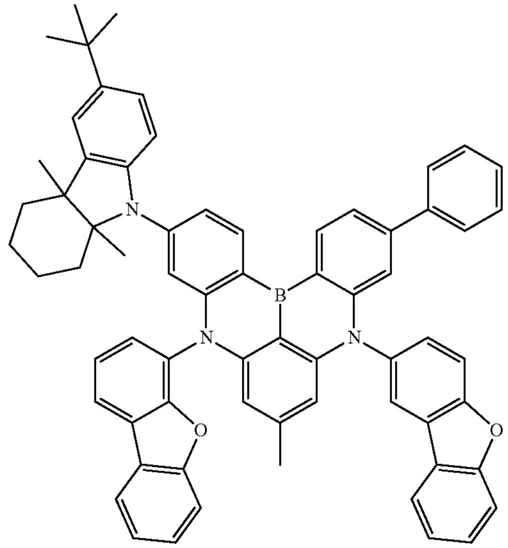
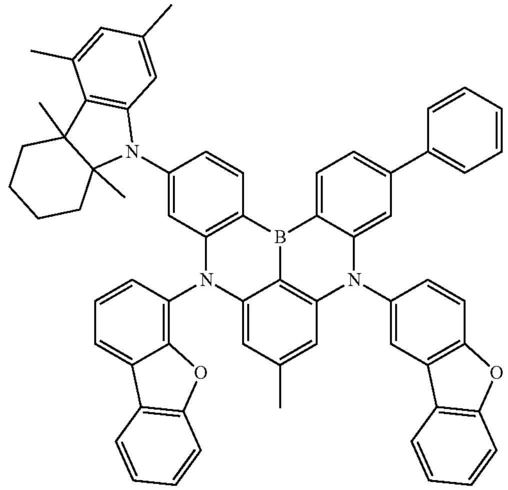
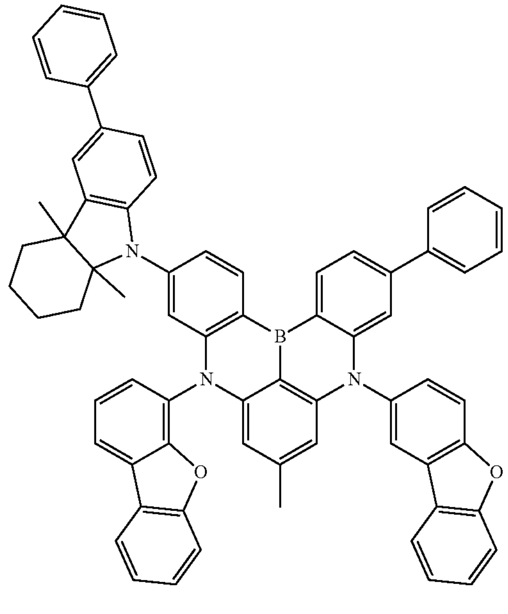
-continued
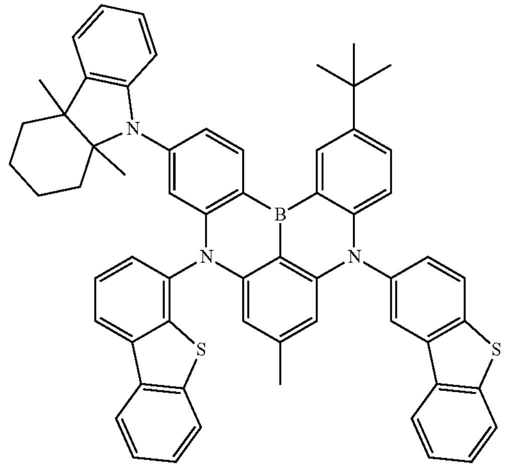
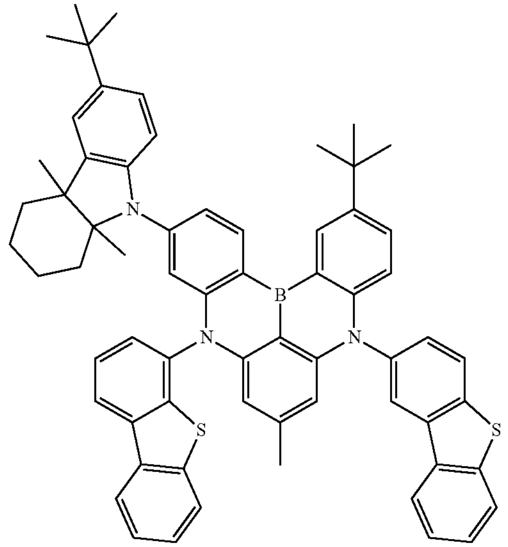
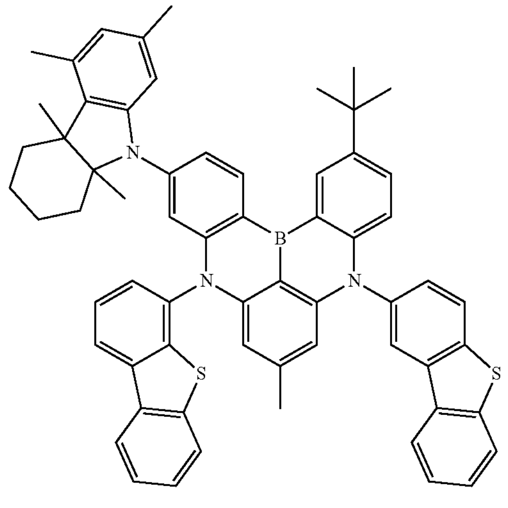

-continued
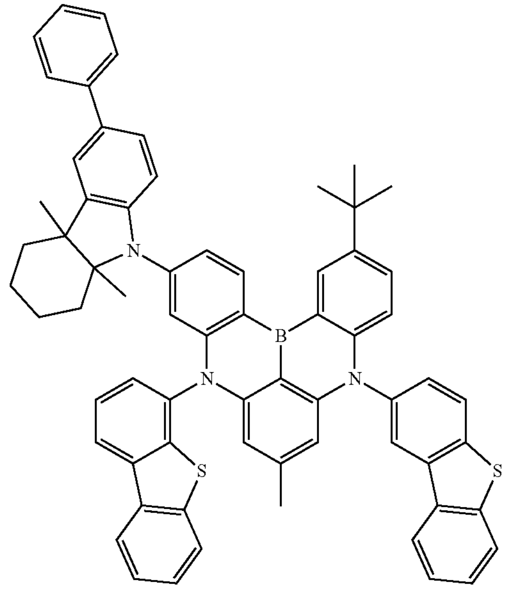
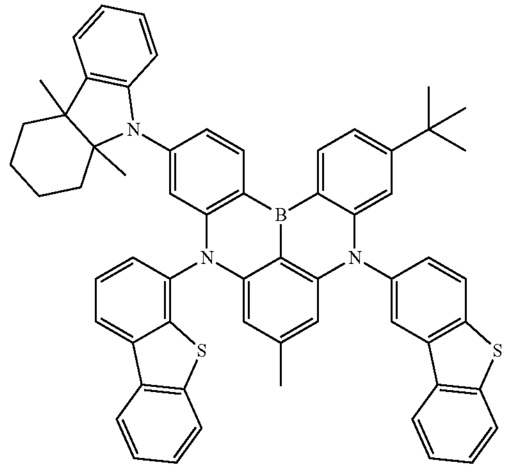
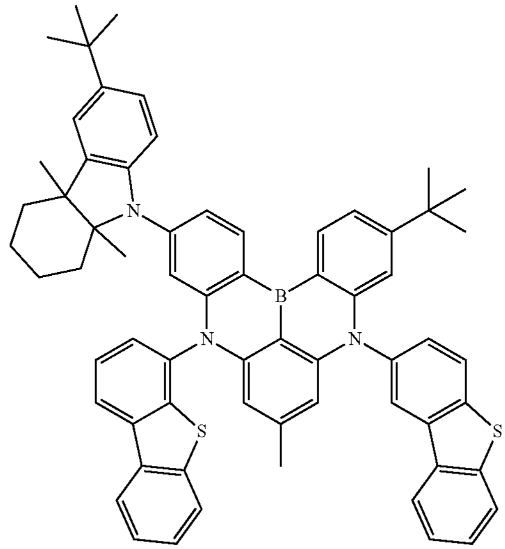
-continued
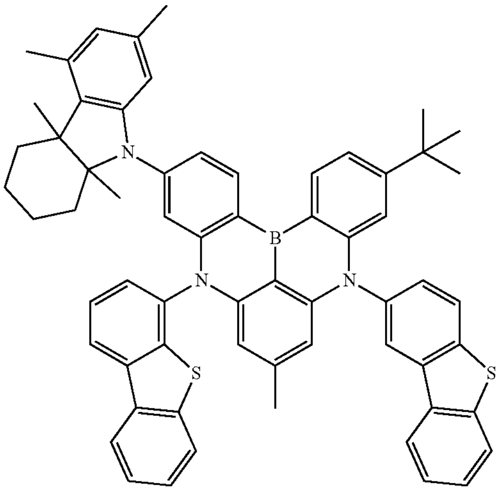
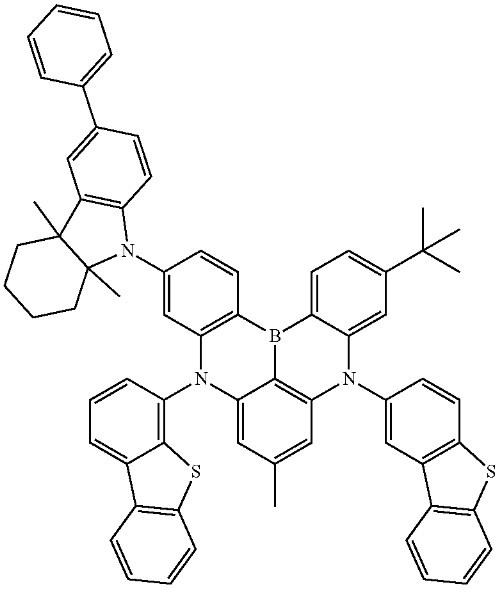
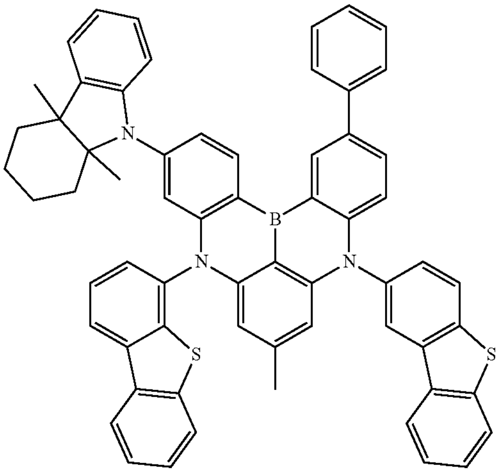

-continued
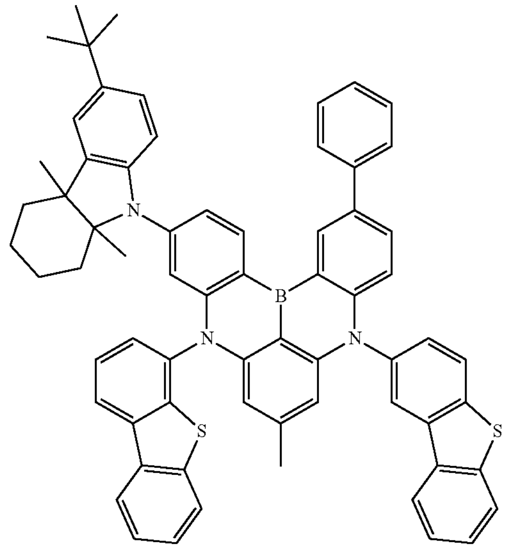
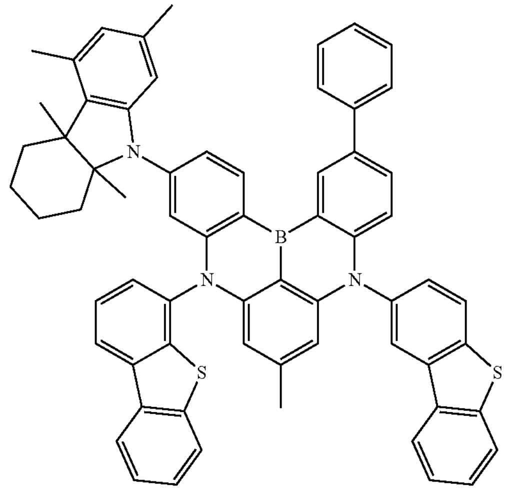
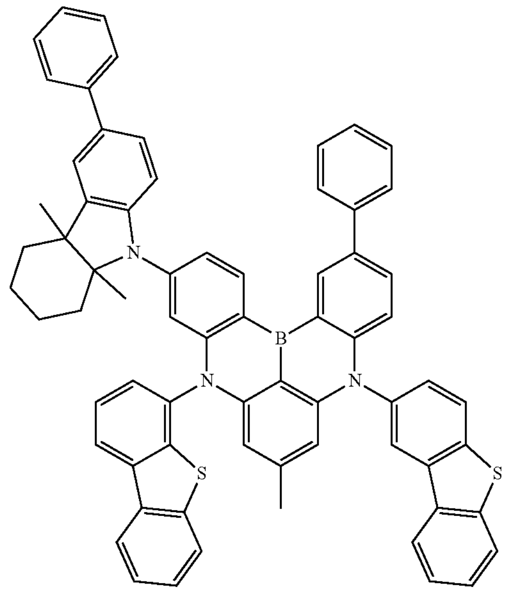
-continued
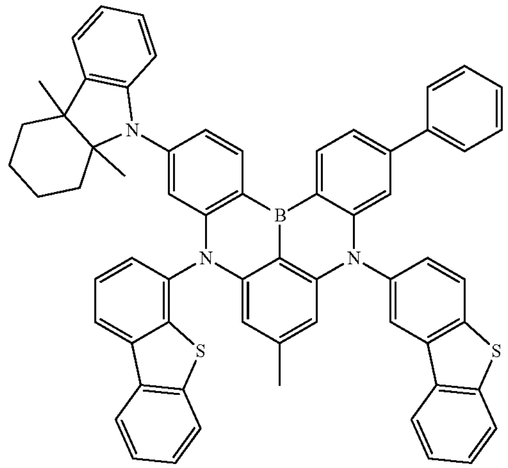
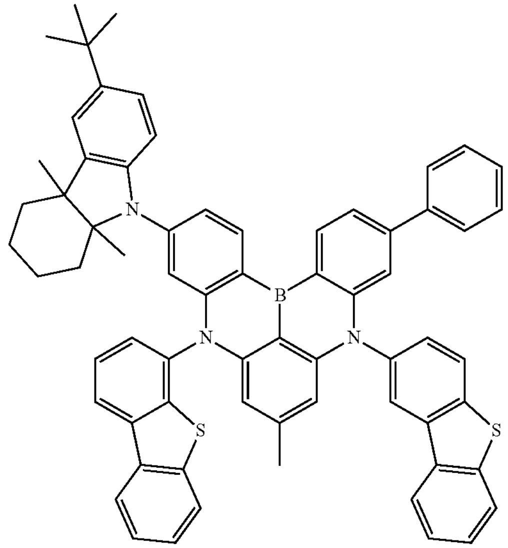
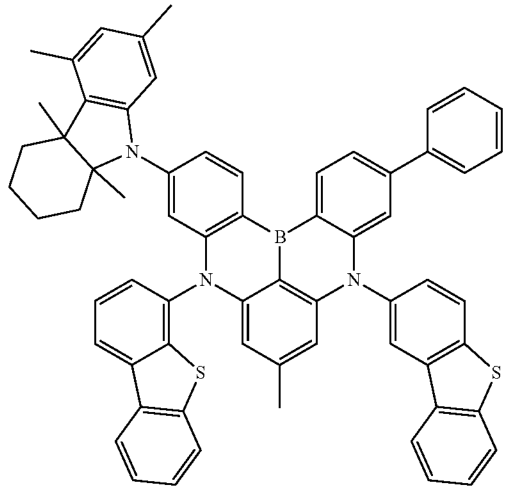

-continued
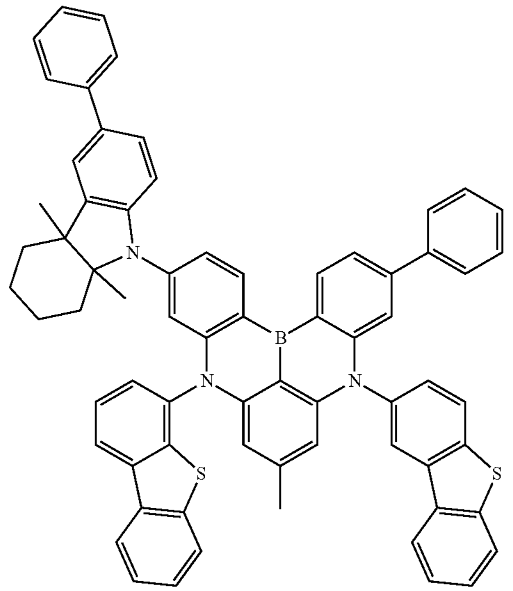
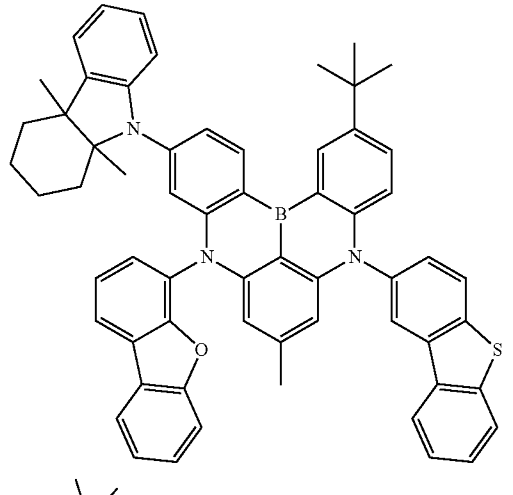
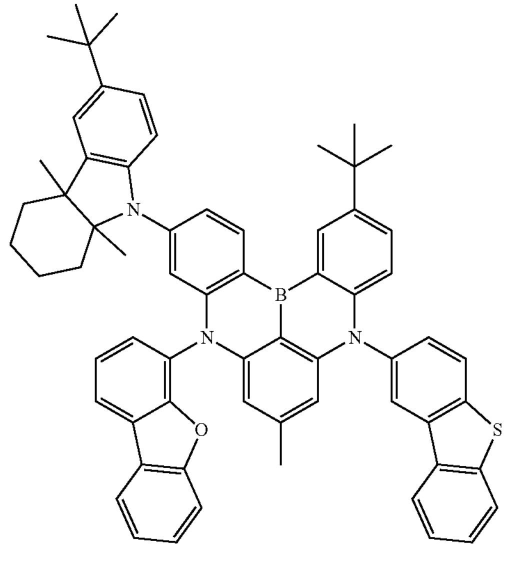
-continued
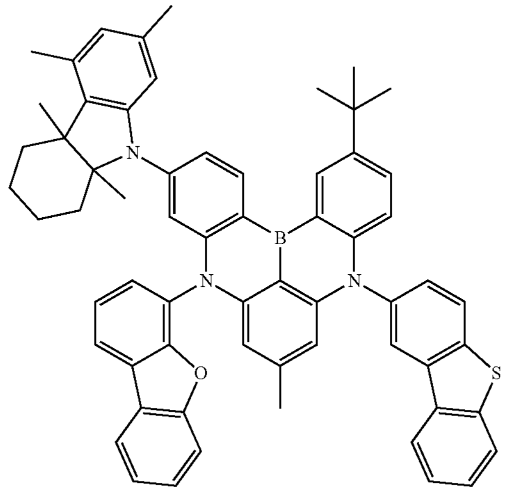
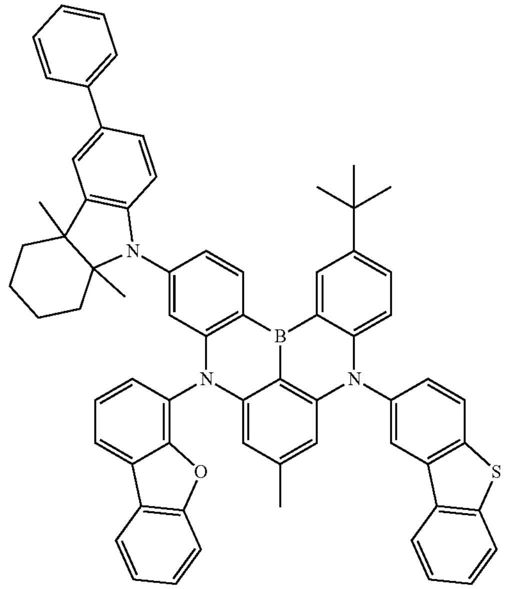
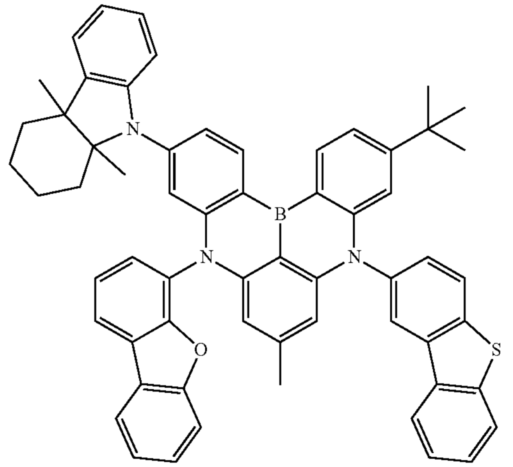

-continued
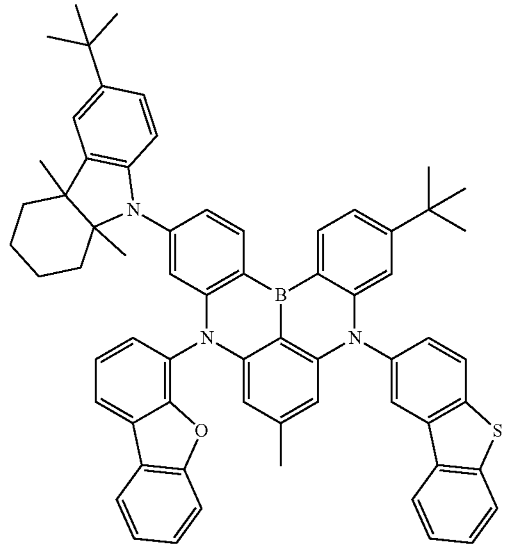
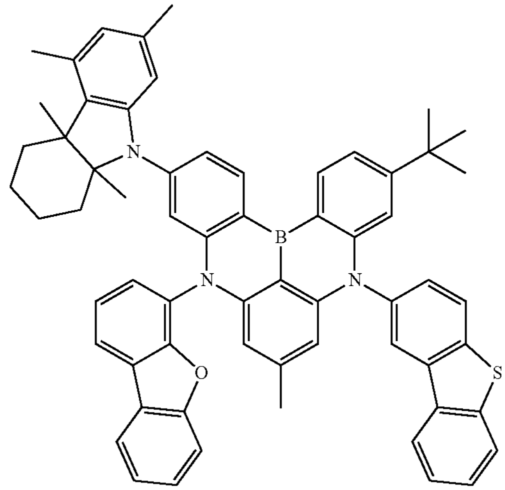
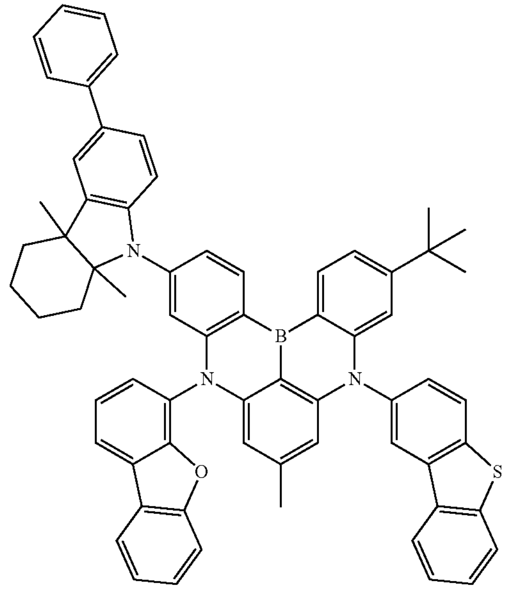
-continued
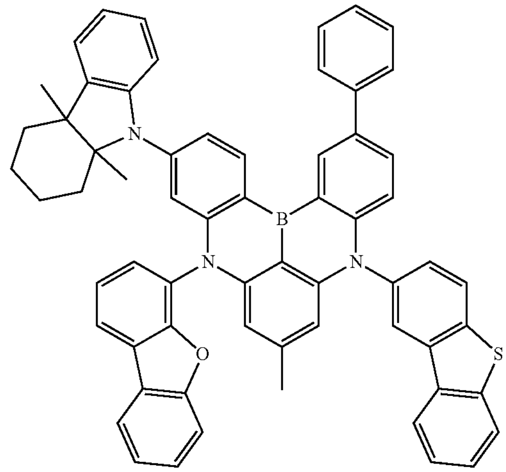
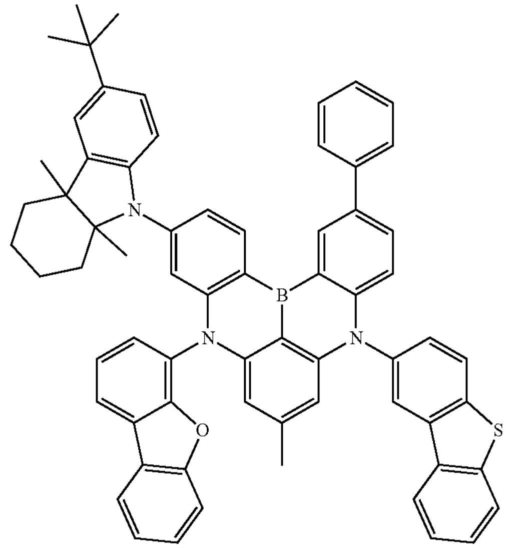
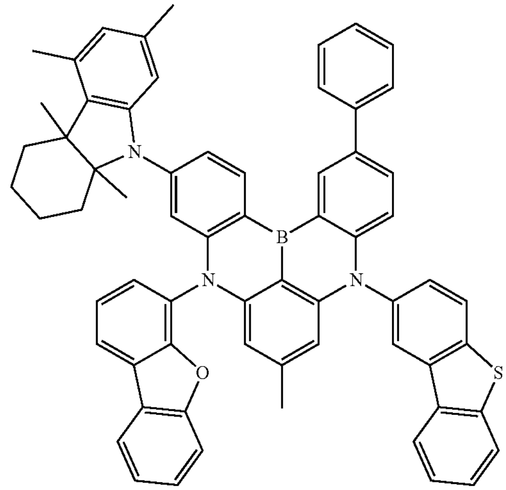

-continued
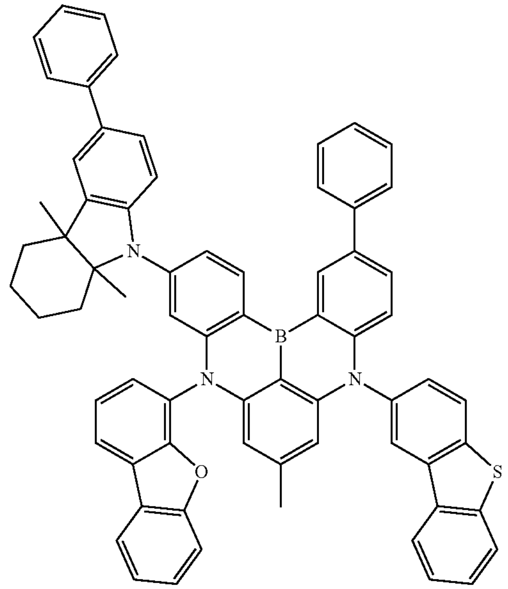
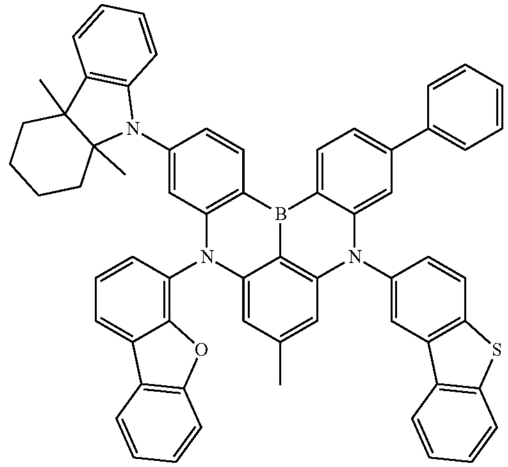
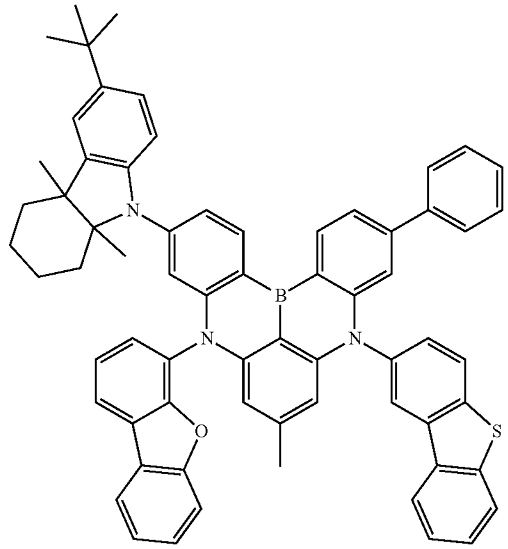
-continued
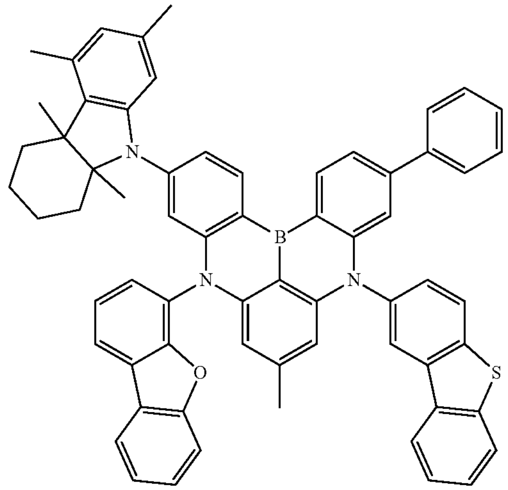
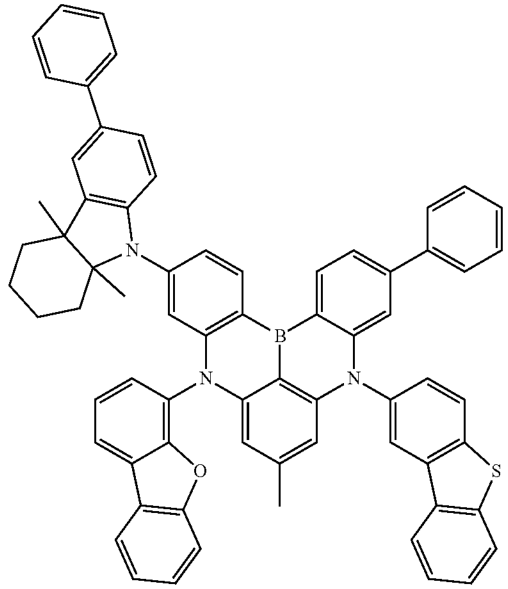
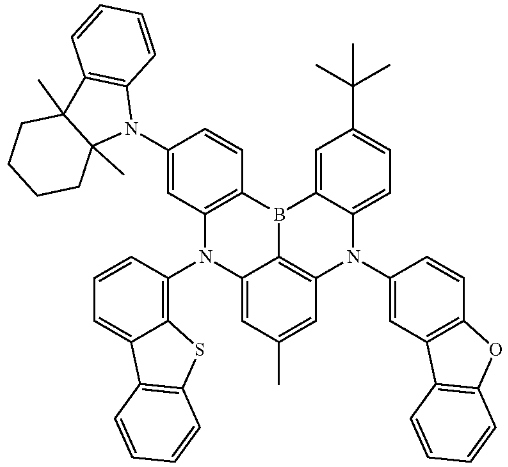

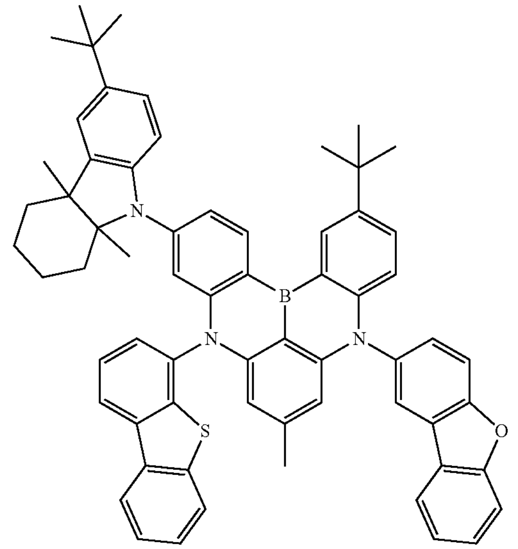
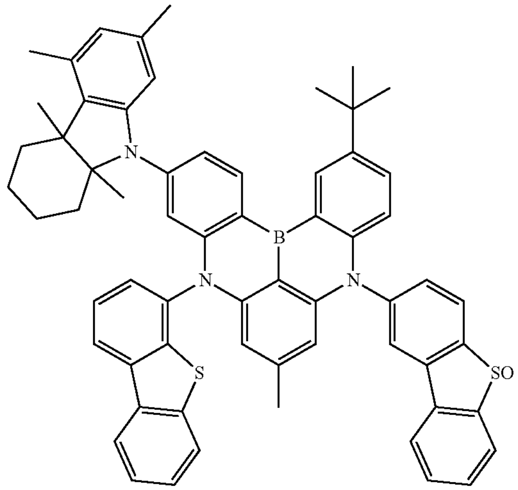
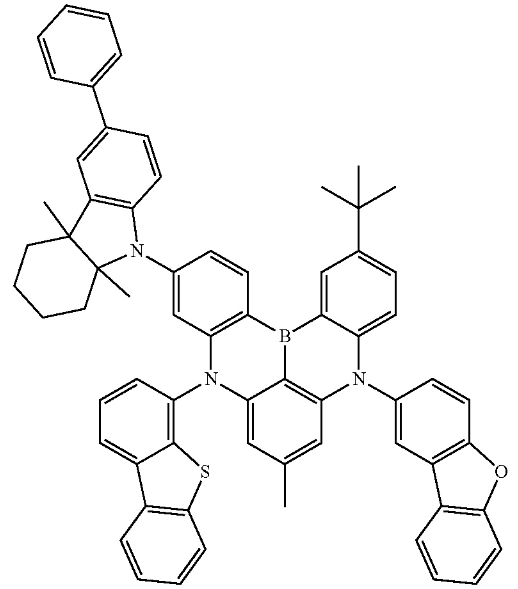
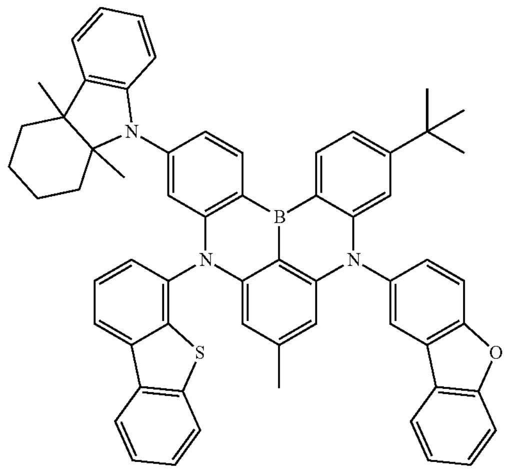
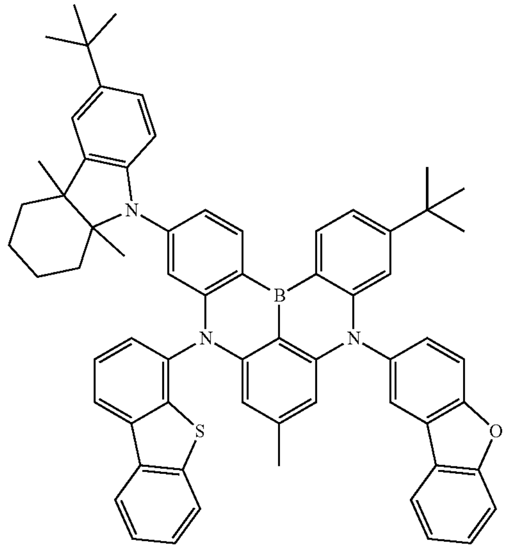
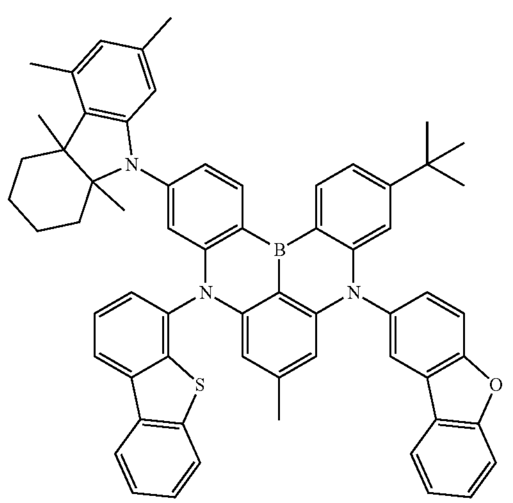

-continued
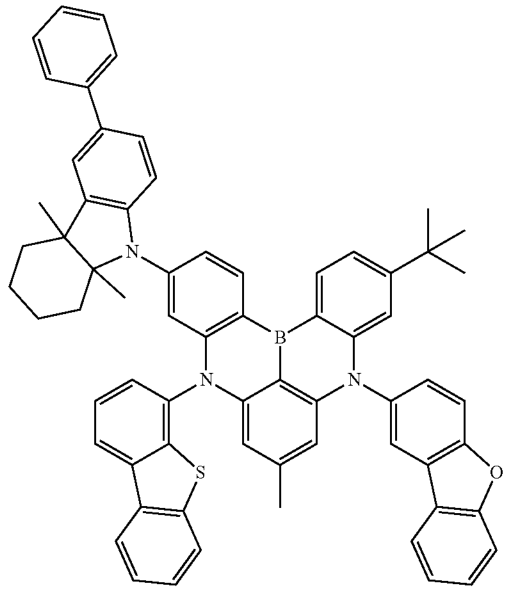
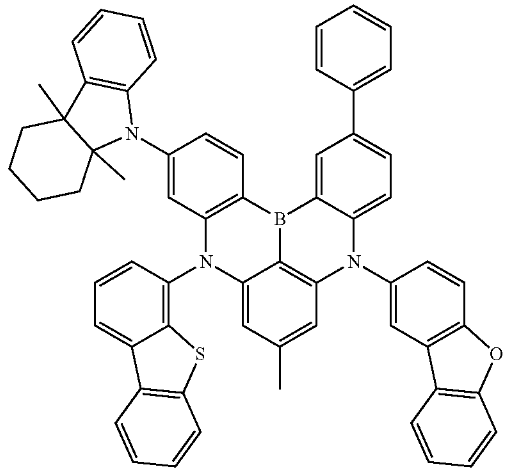
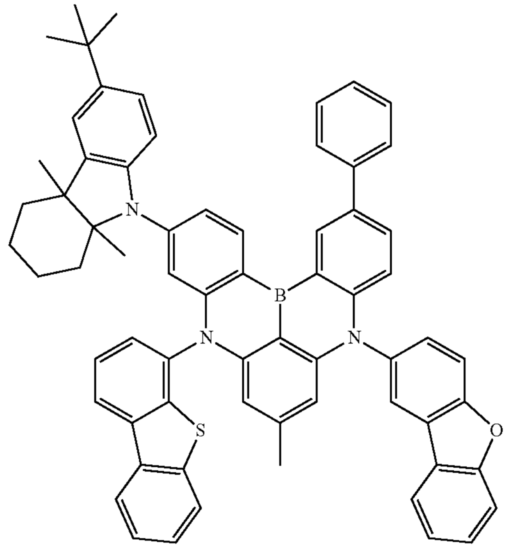
-continued
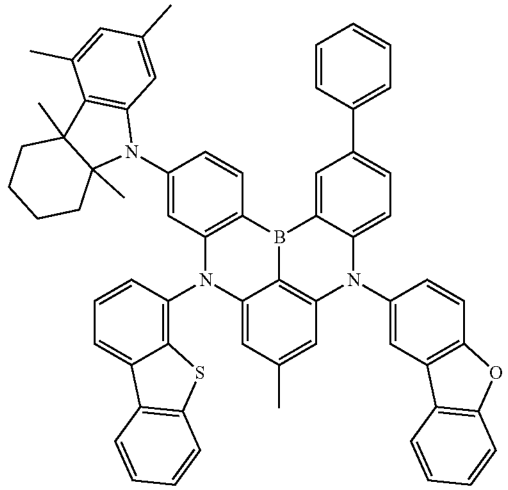
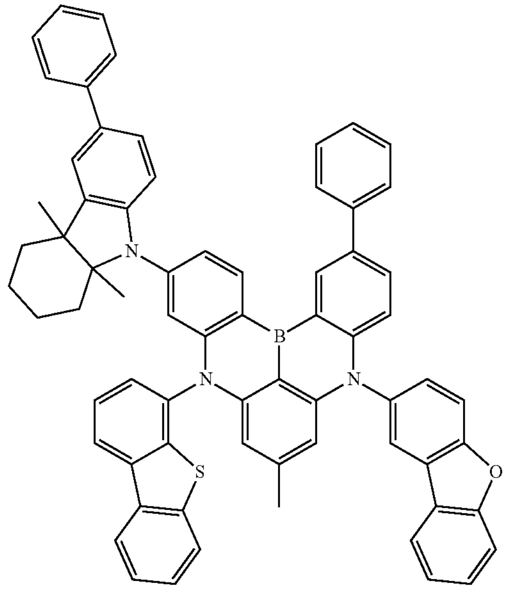
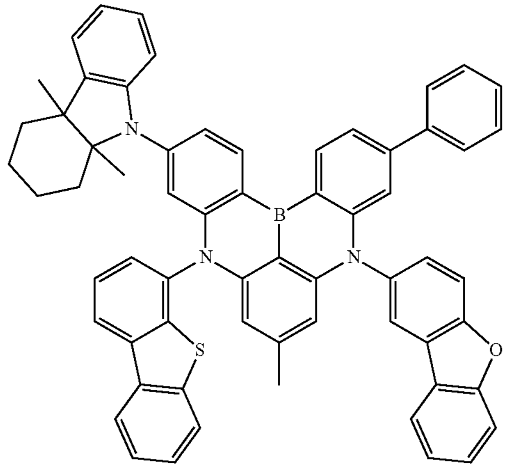

-continued
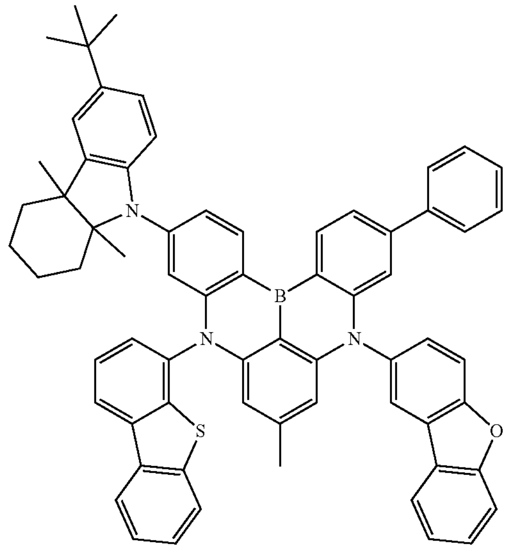
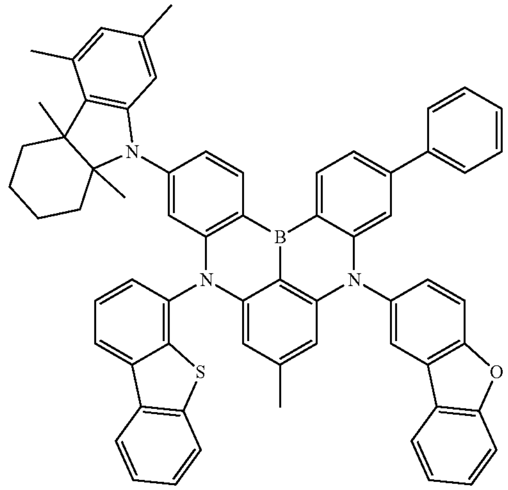
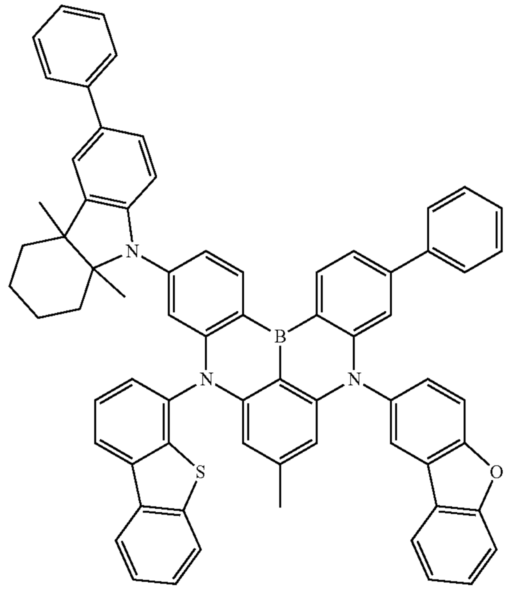
-continued
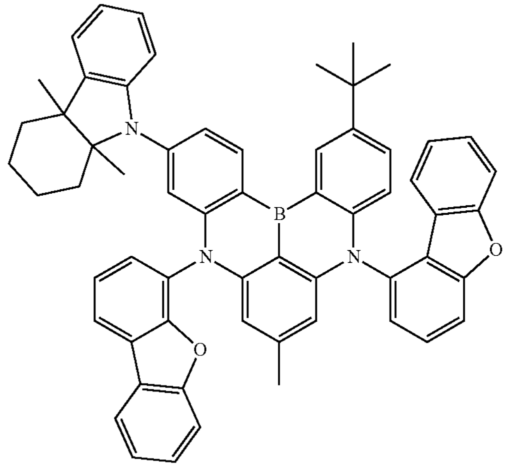
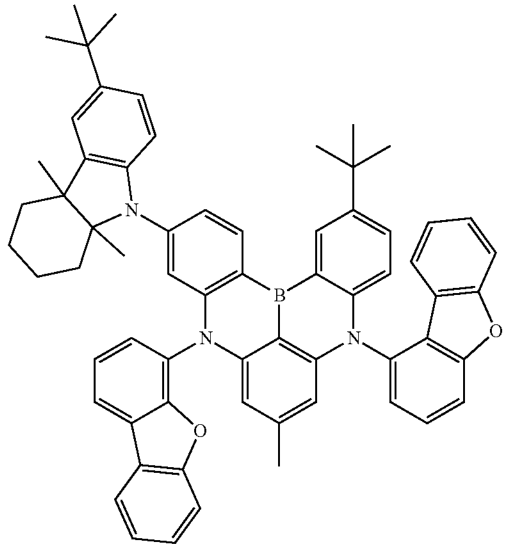
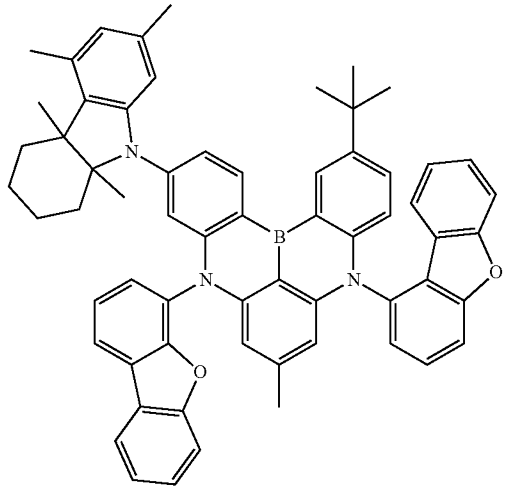

-continued
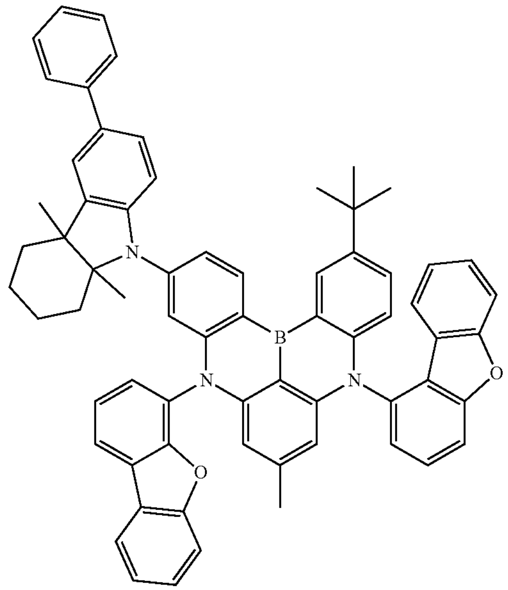
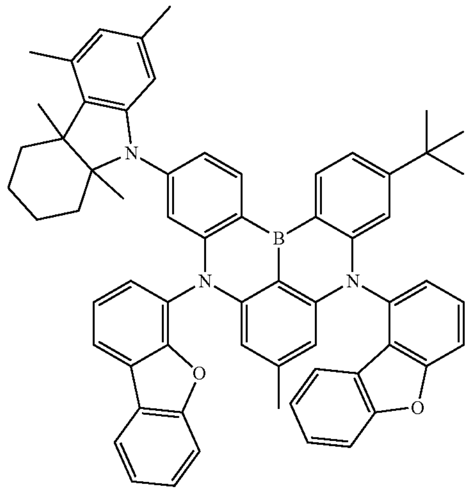
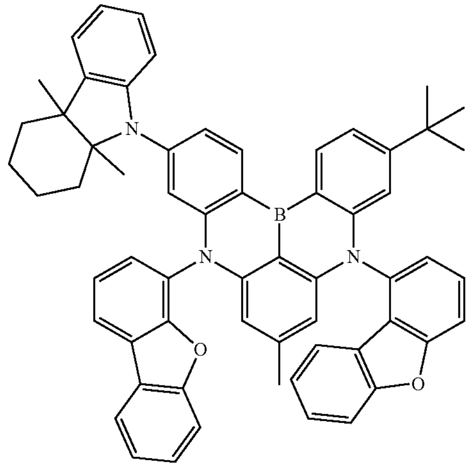
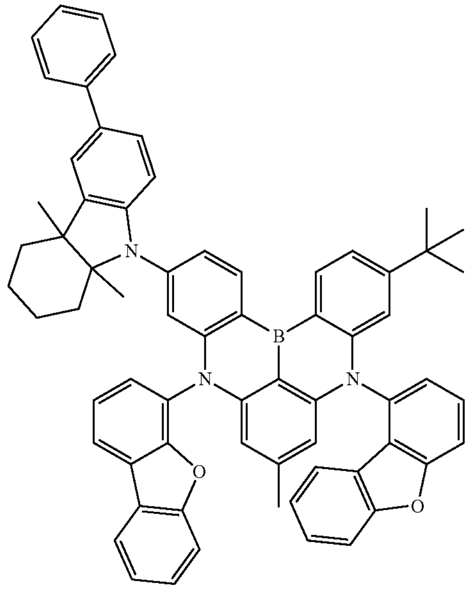
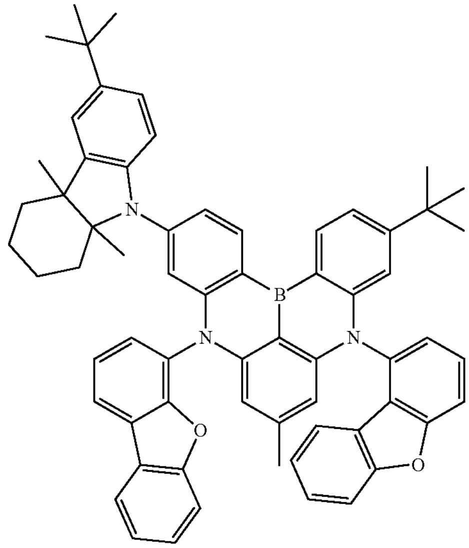
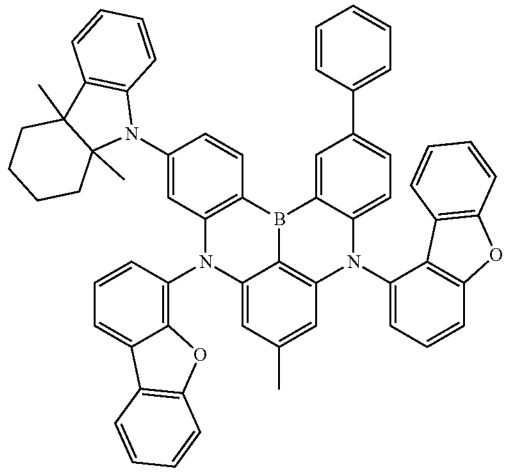

-continued
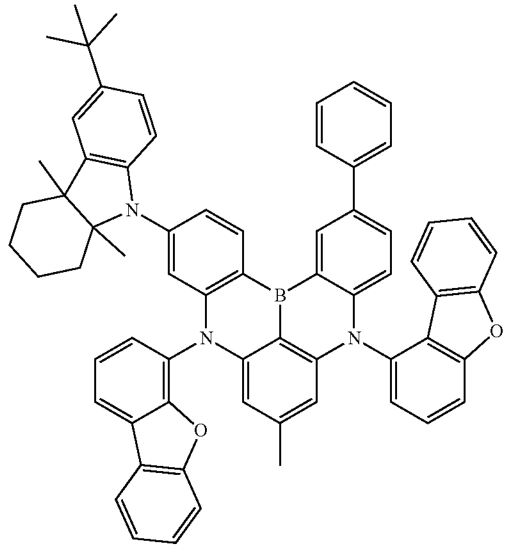
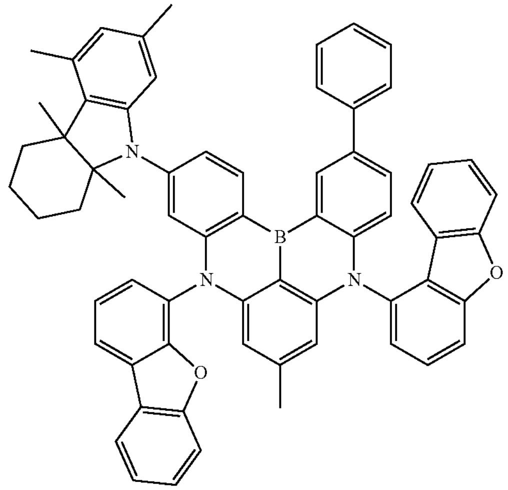
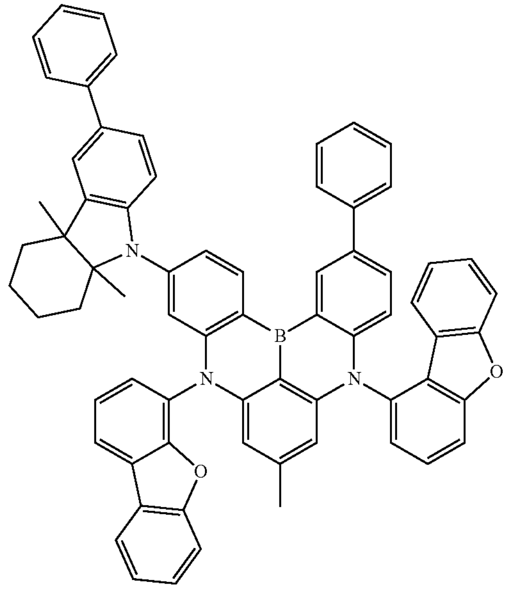
-continued
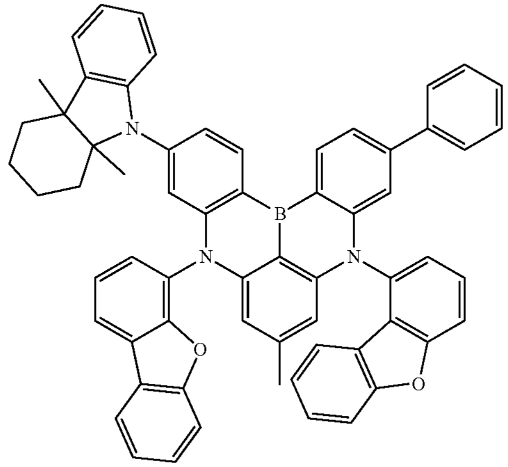
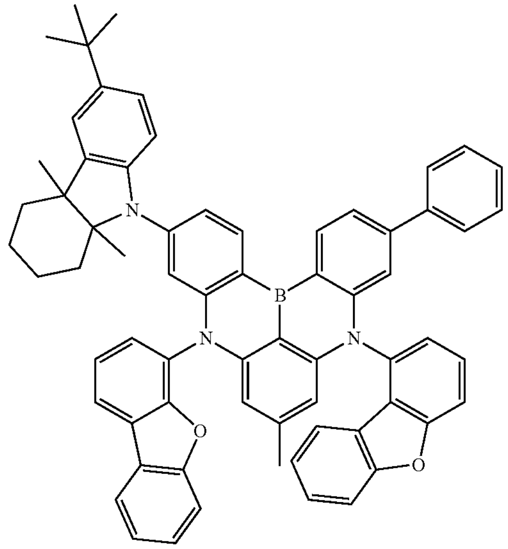
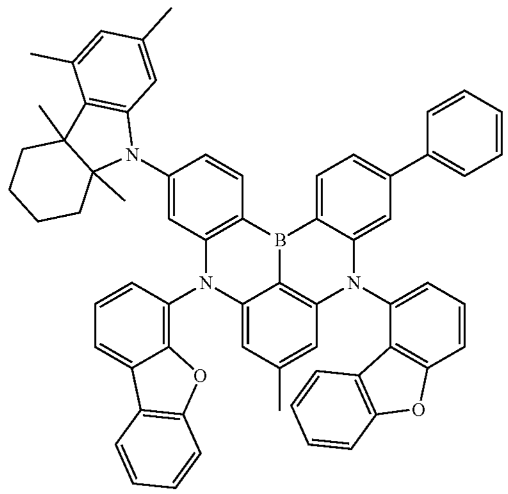

-continued
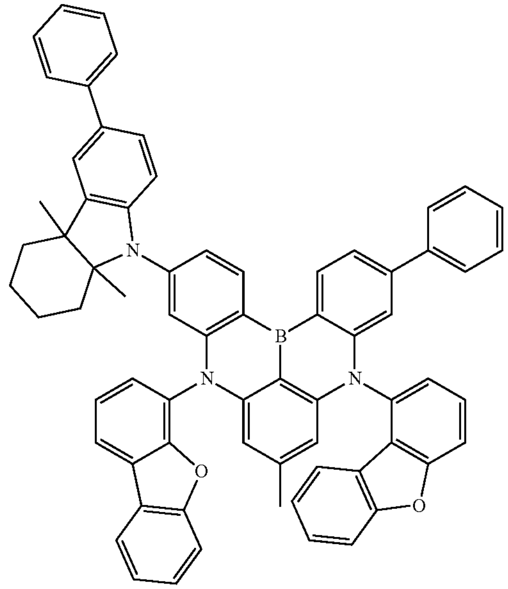
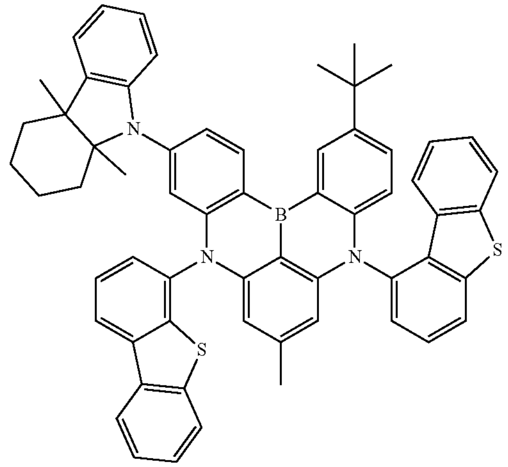
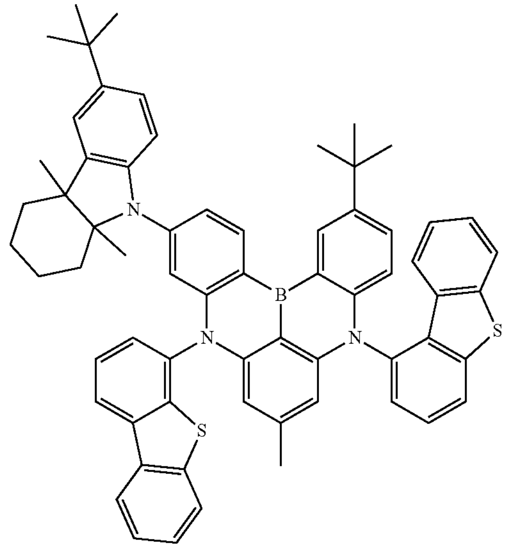
-continued
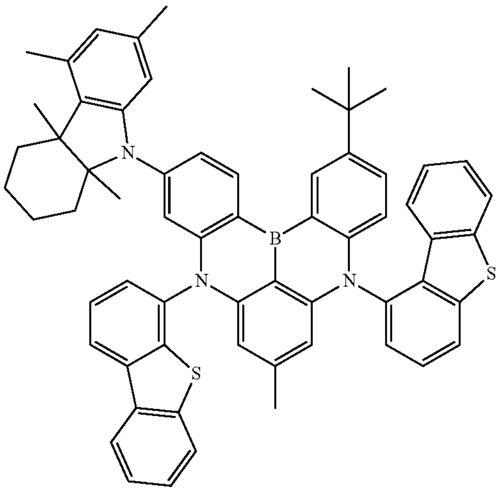
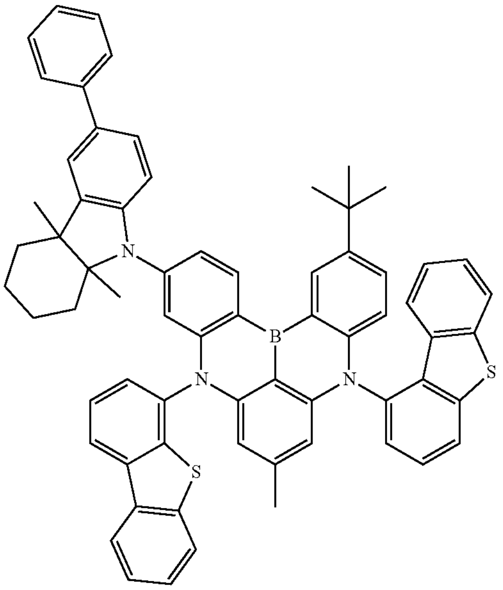
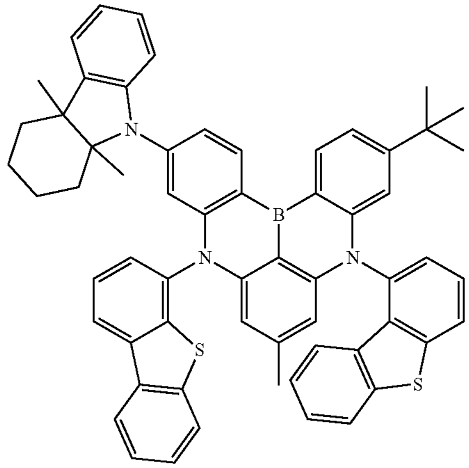

-continued
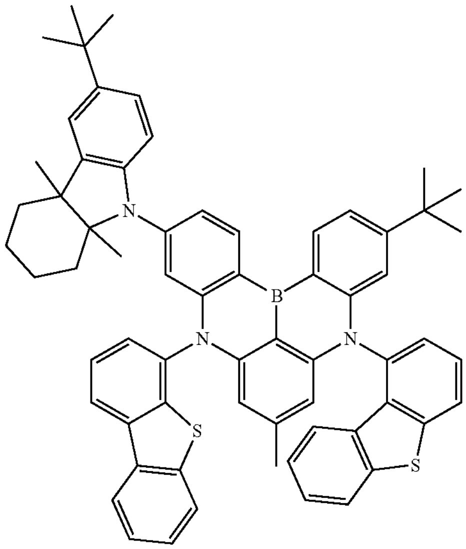
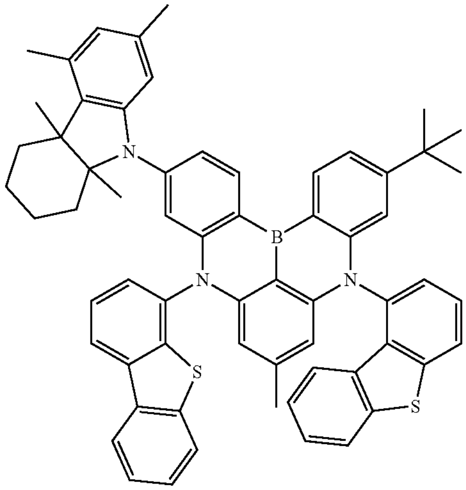
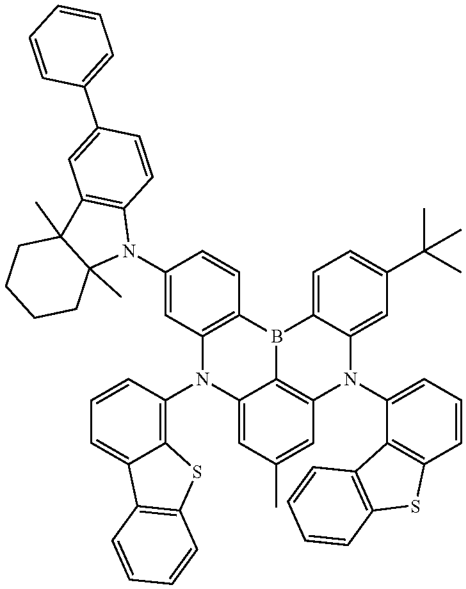
-continued
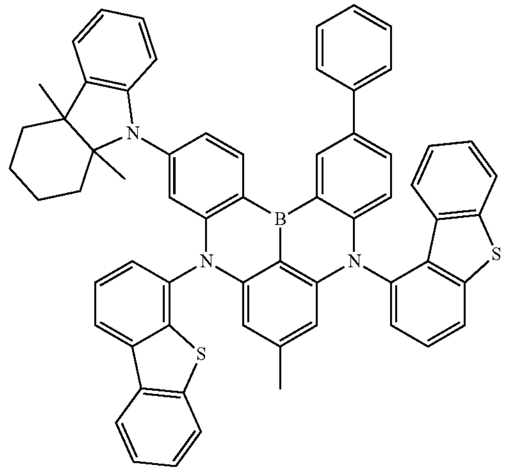
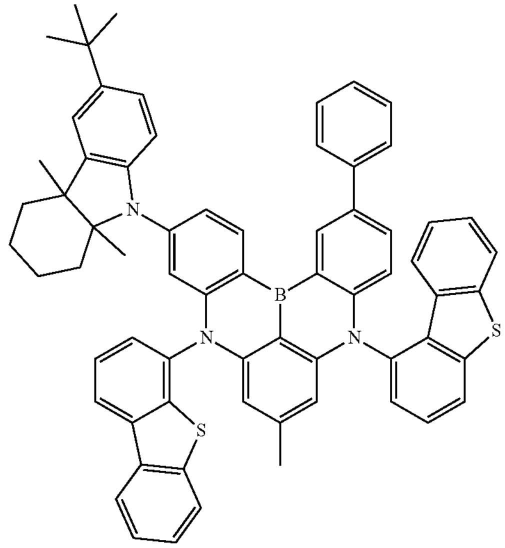
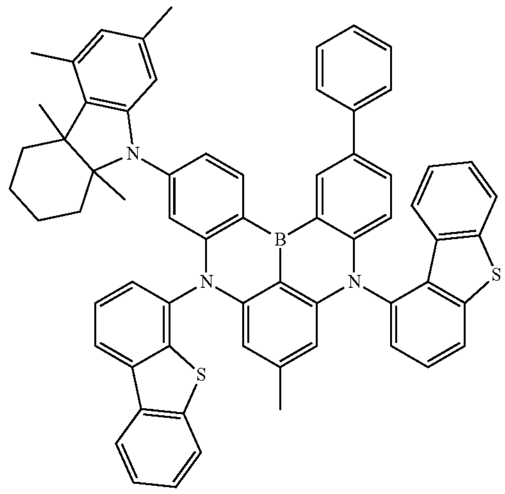

-continued
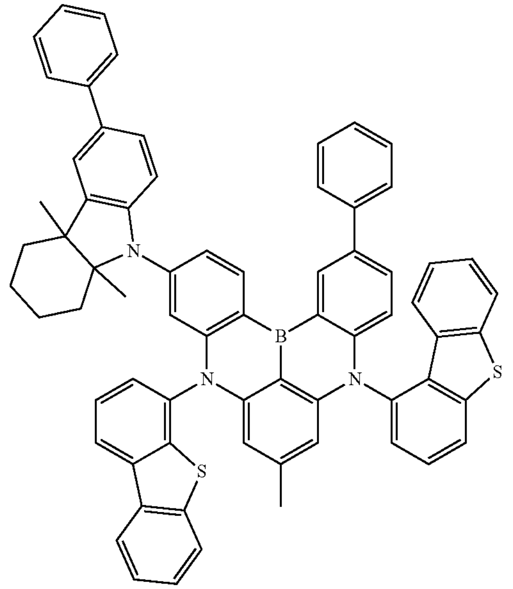
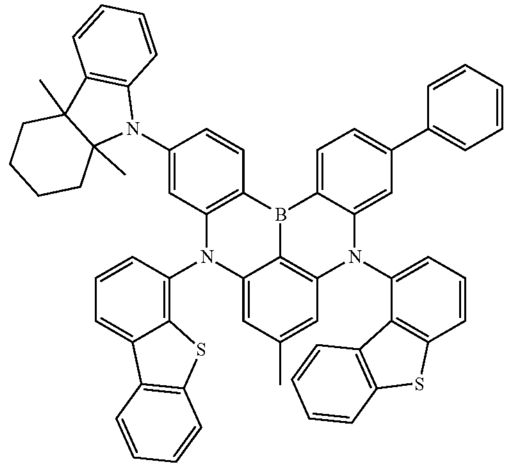
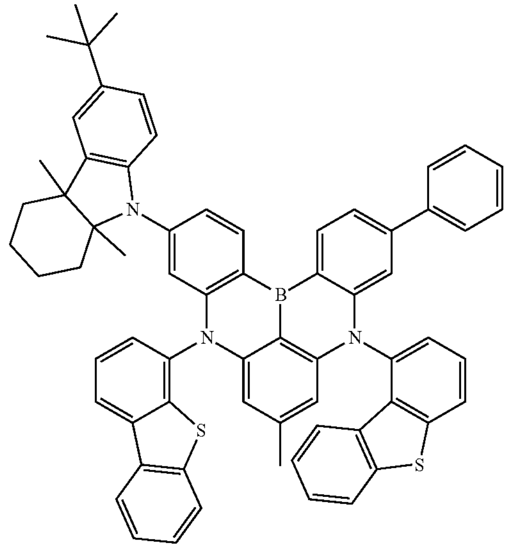
-continued
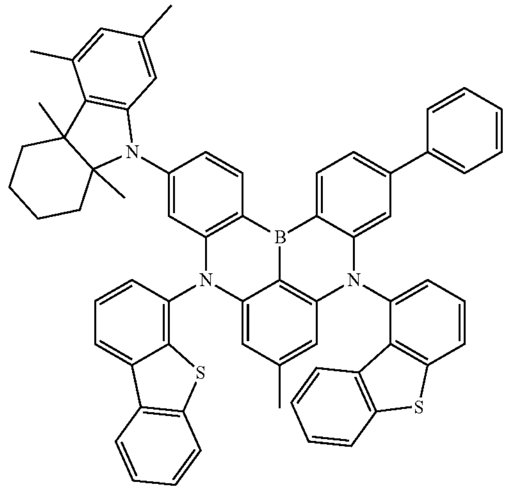
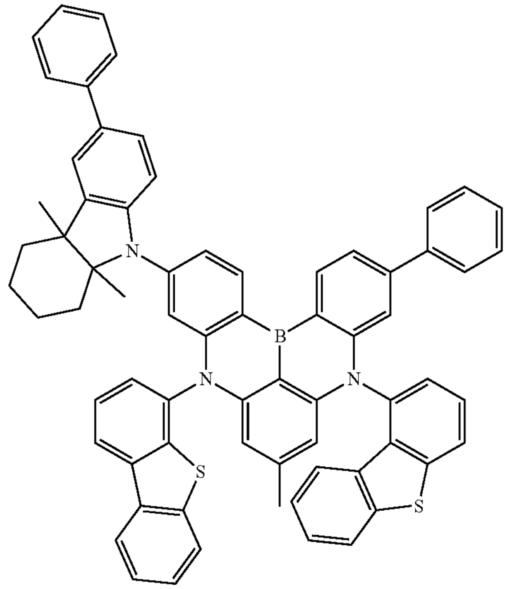
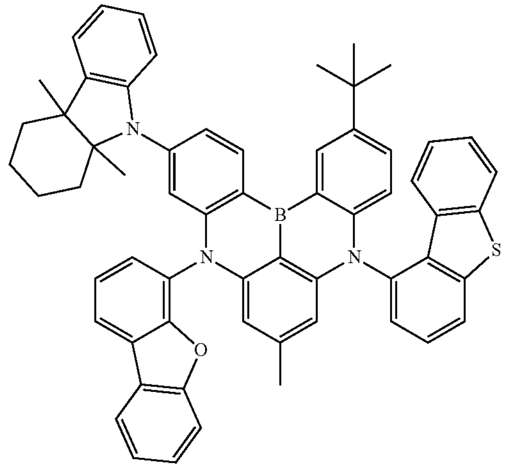

-continued
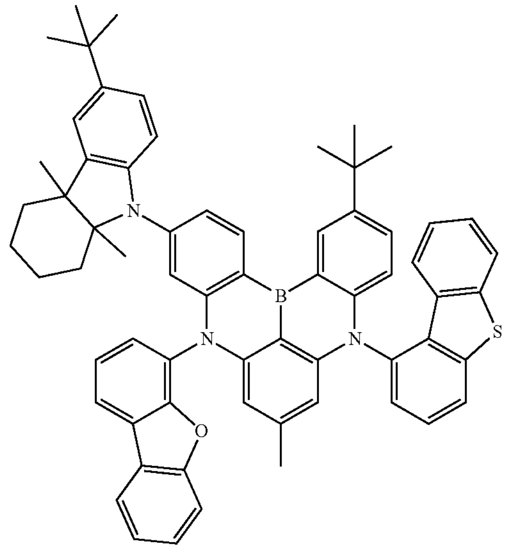
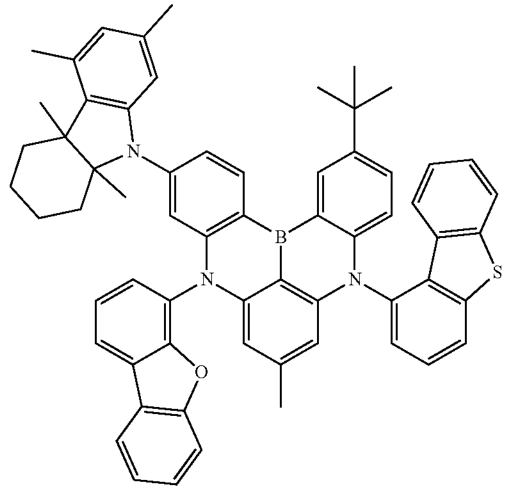
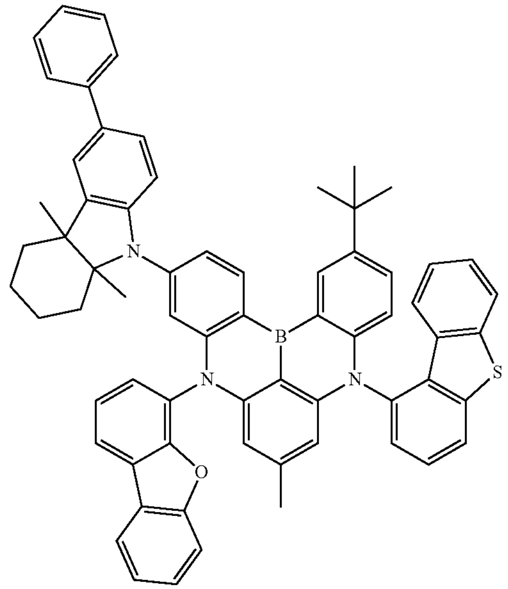
-continued
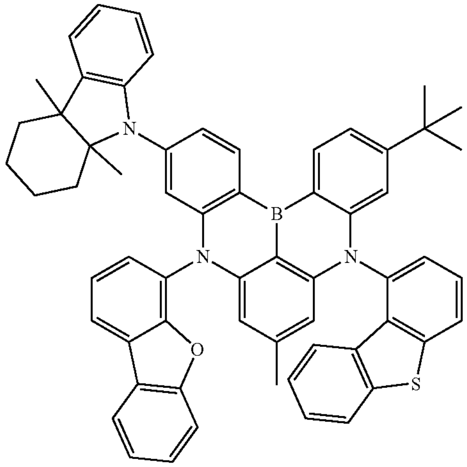
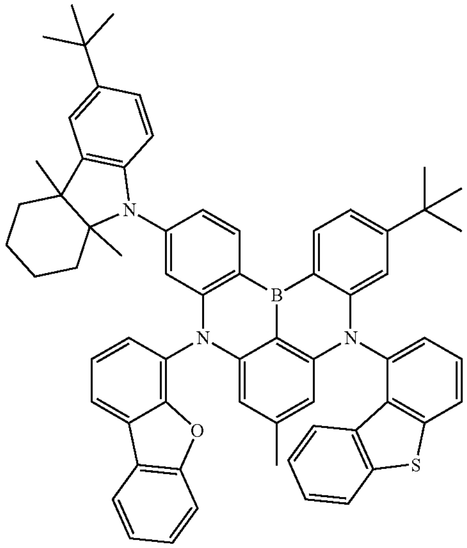
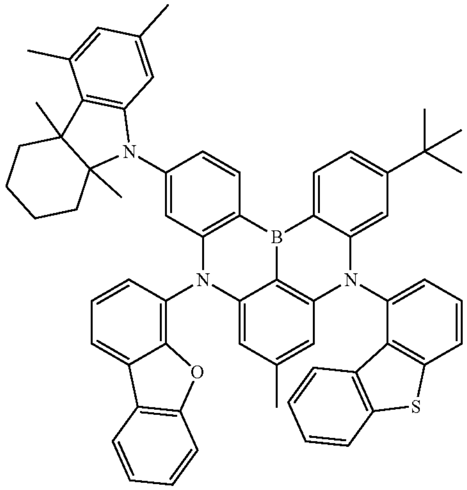

-continued
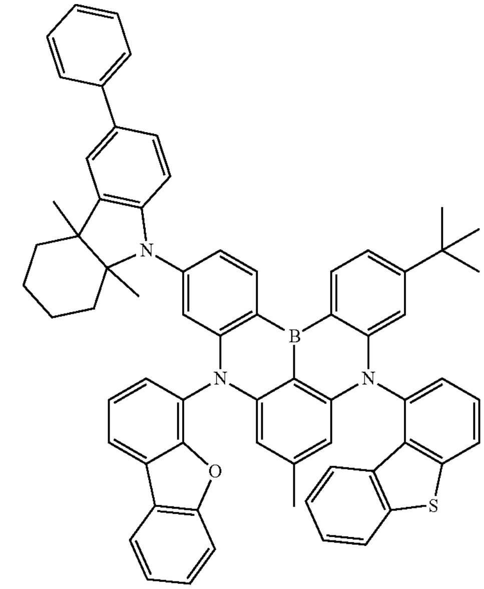
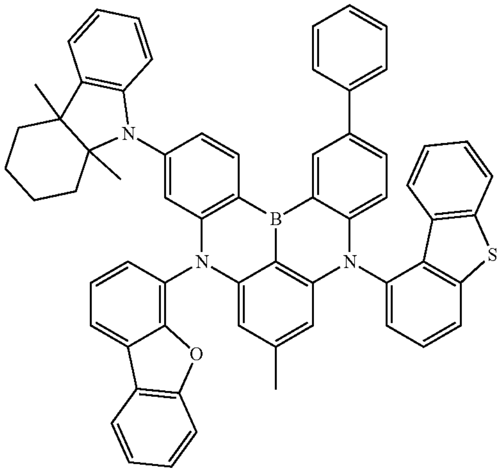
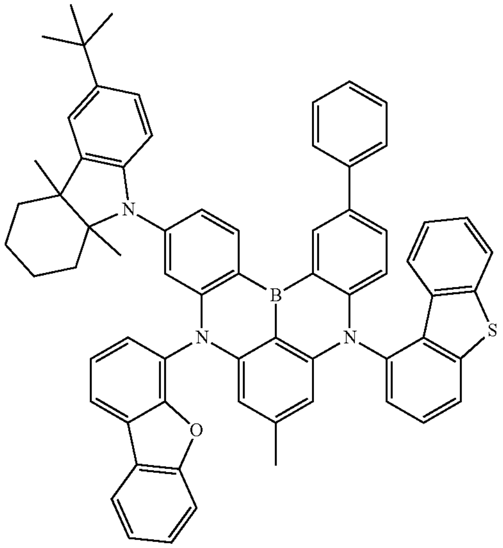
-continued
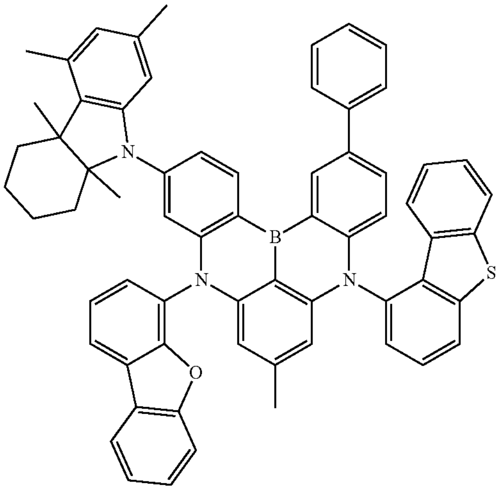
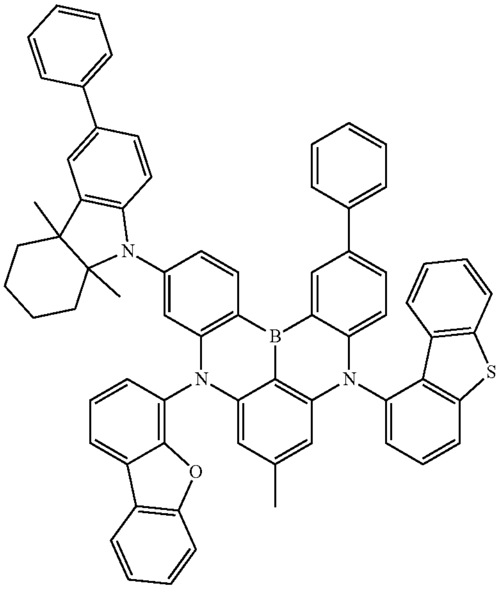
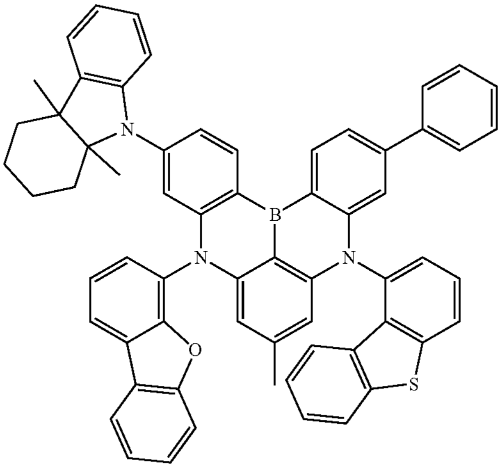

-continued
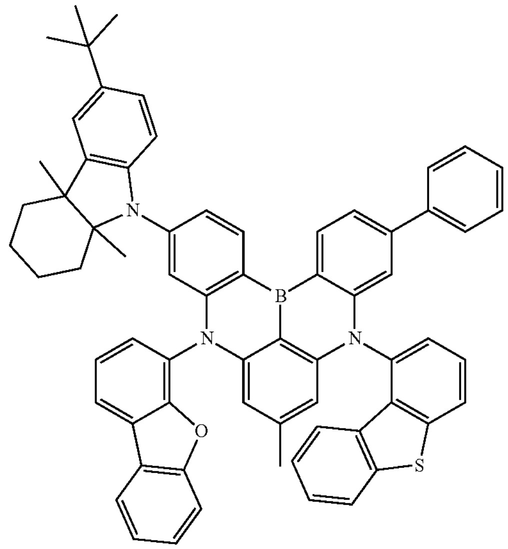
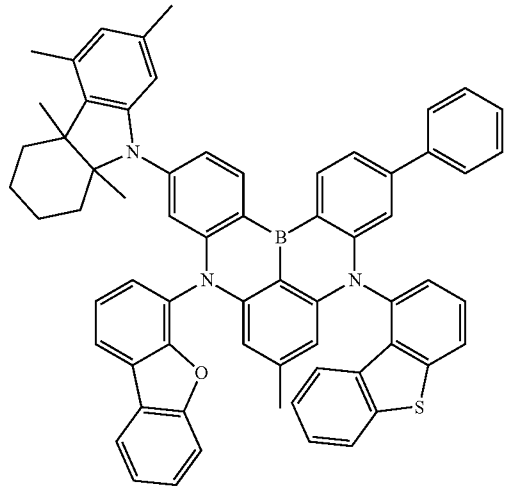
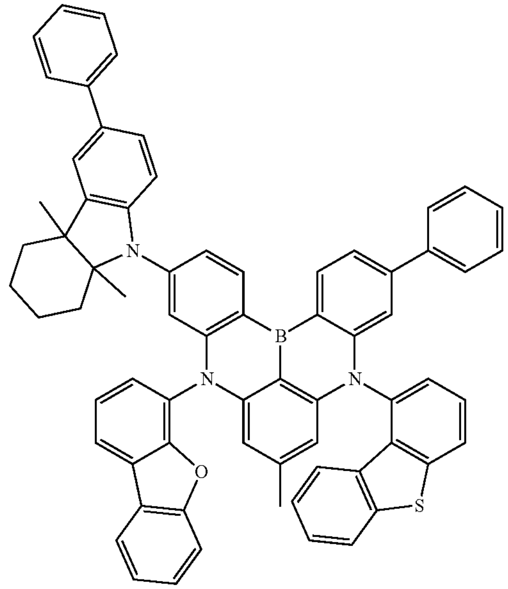
-continued
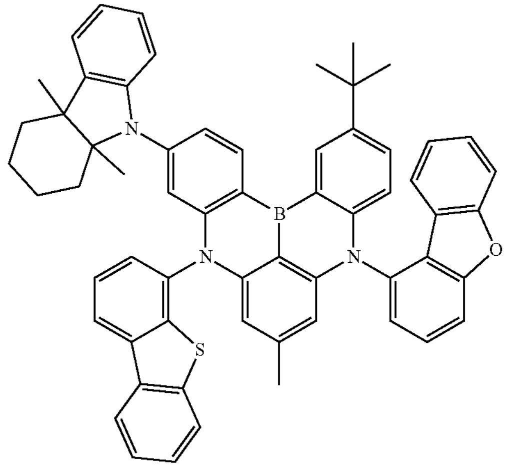
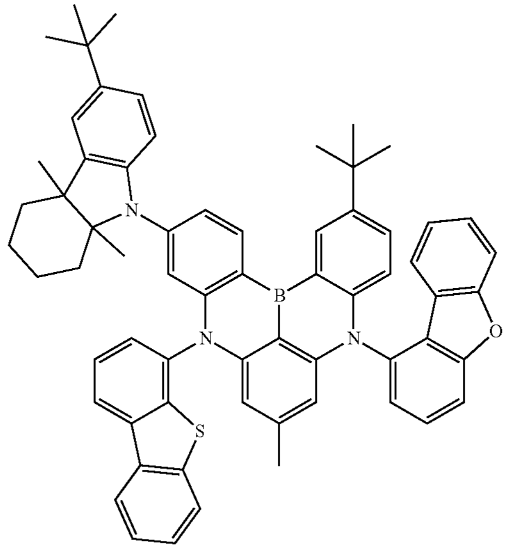
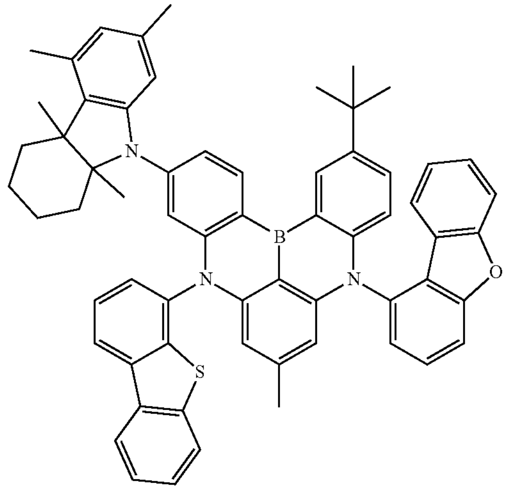

-continued
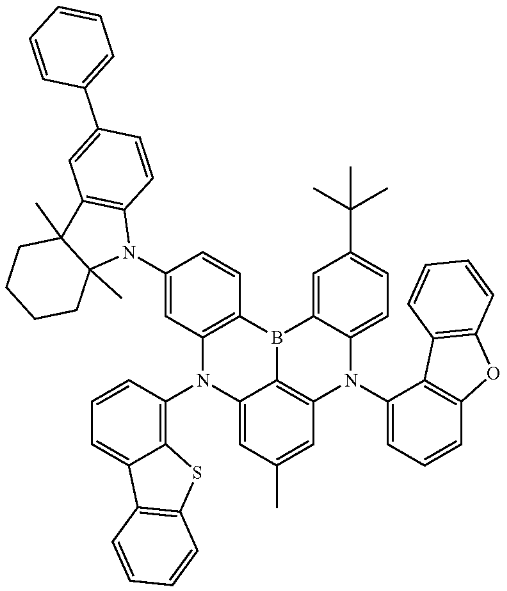
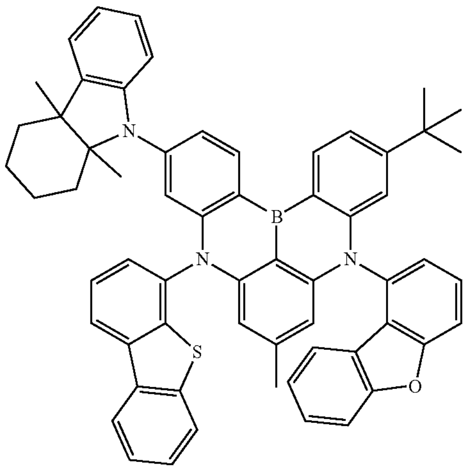
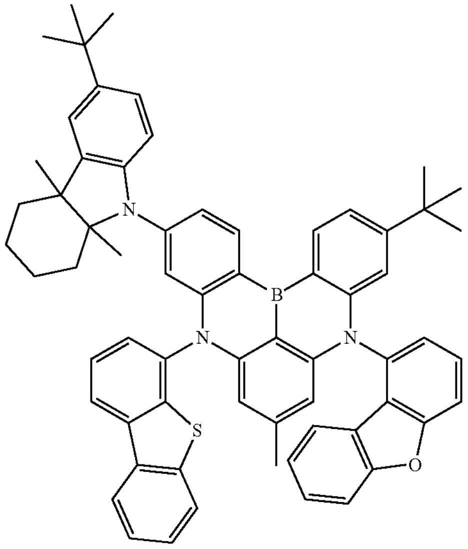
-continued
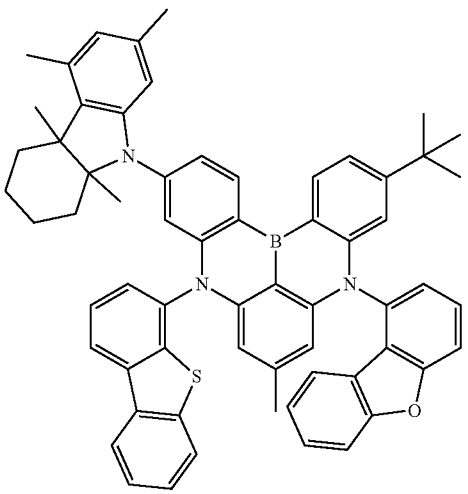
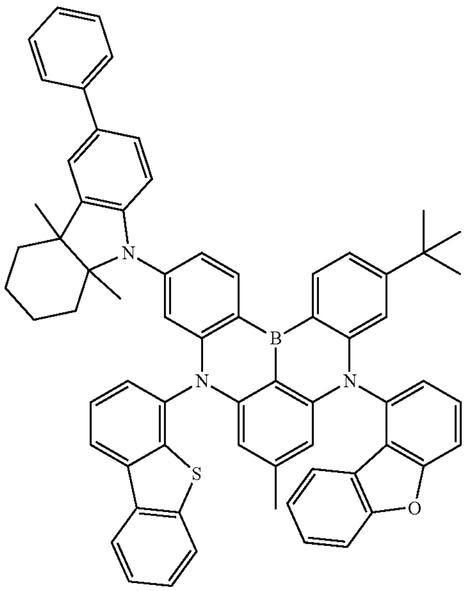
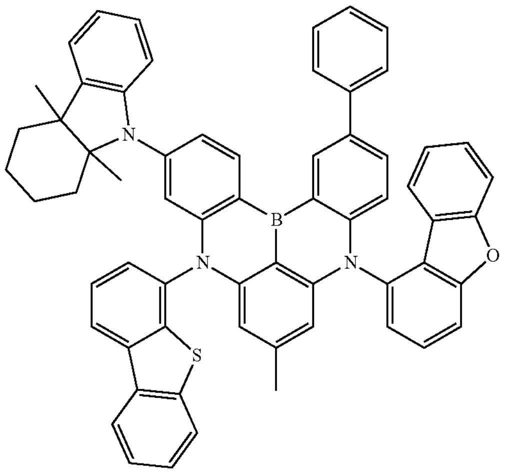

-continued
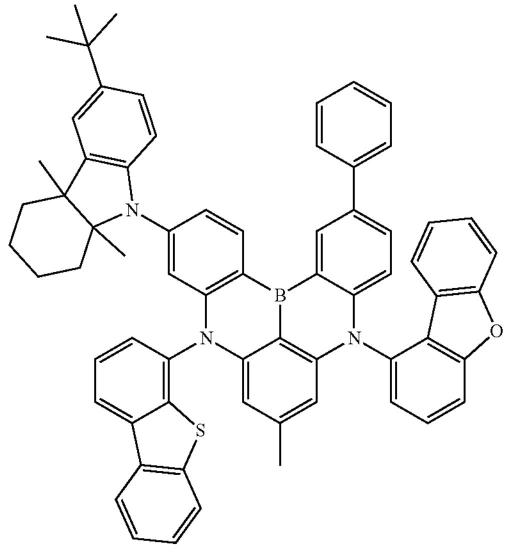
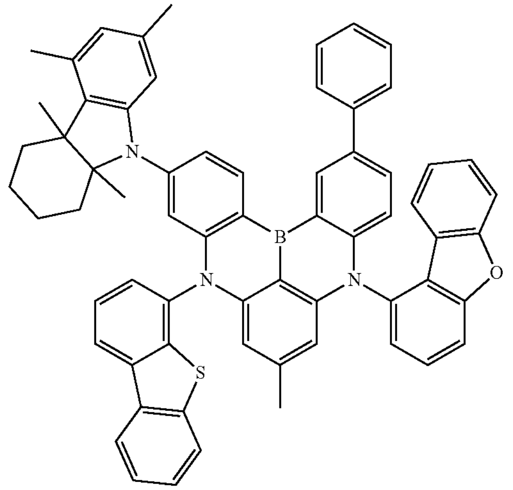
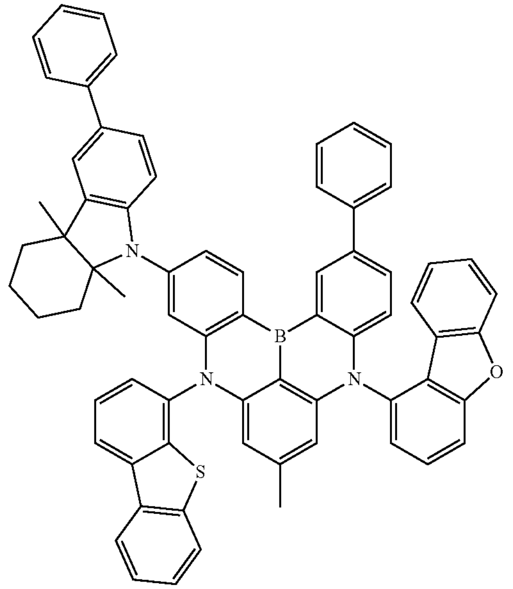
-continued
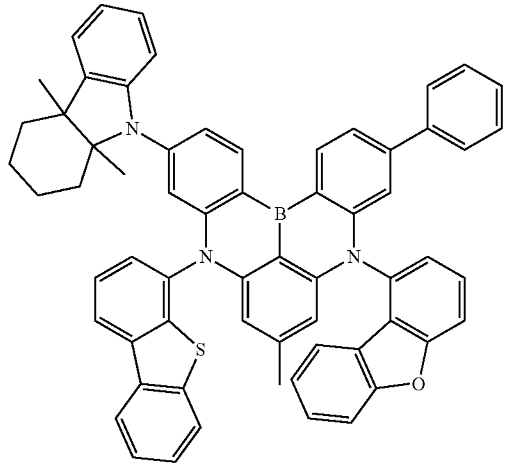
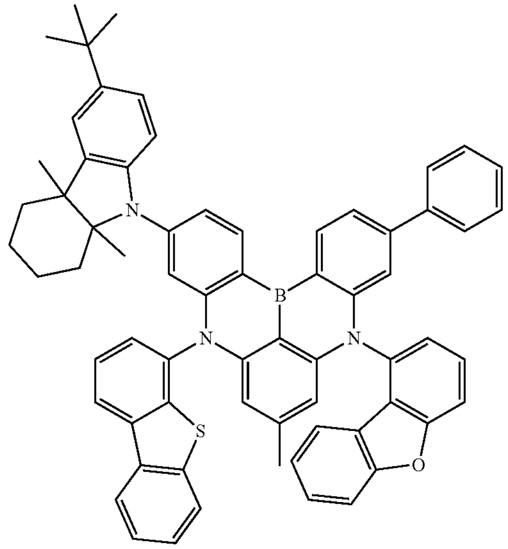
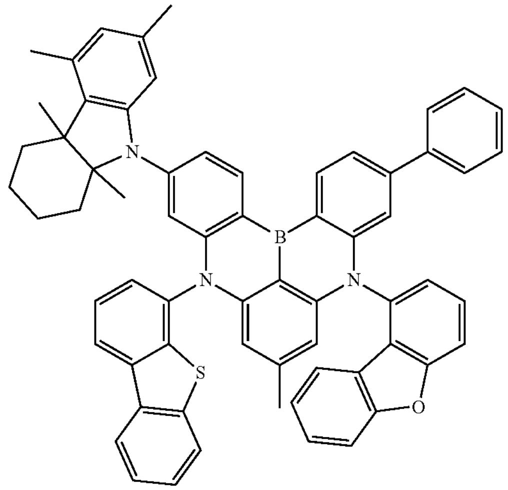

-continued
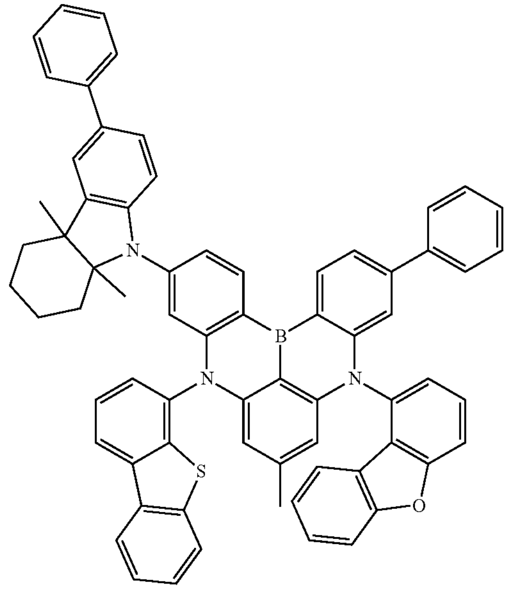
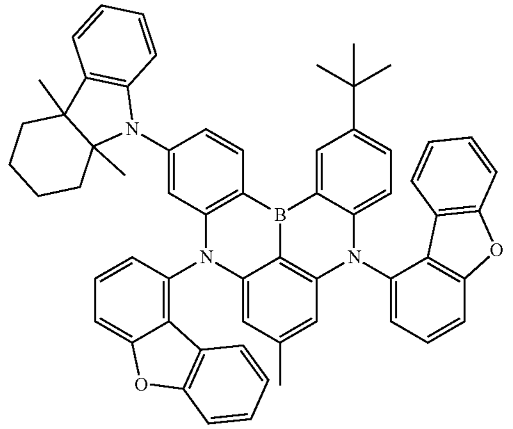
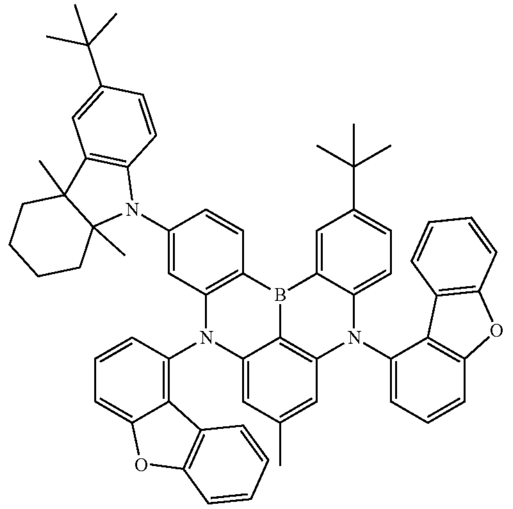
-continued
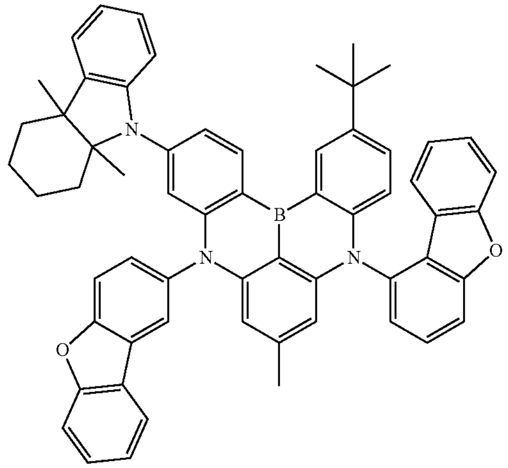
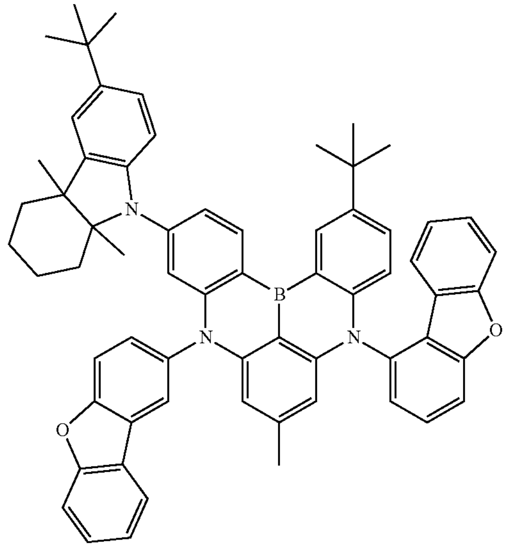 [SMILES: Cc1cc2c3c(c1)N(c1cccc4oc5ccccc5c14)c1ccc(C(C)(C)C)cc1B3c1ccc(N3c4ccc(C(C)(C)C)cc4C4(C)CCCCC34C)cc1N2c1ccc2sc3ccccc3c2c1]
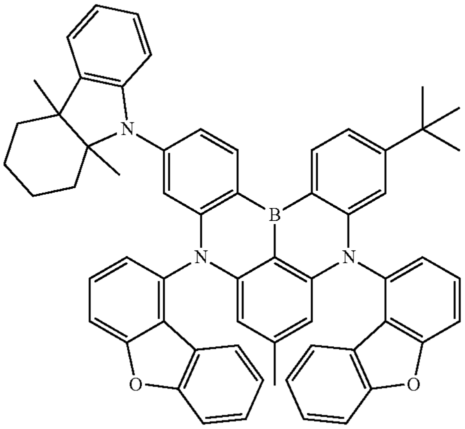

-continued
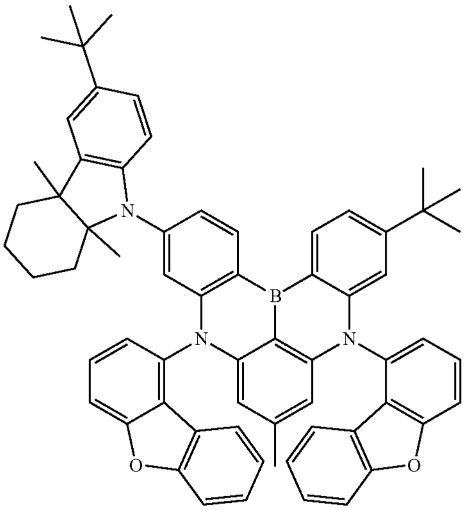
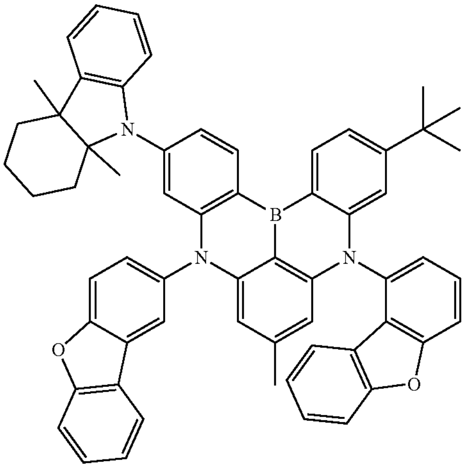
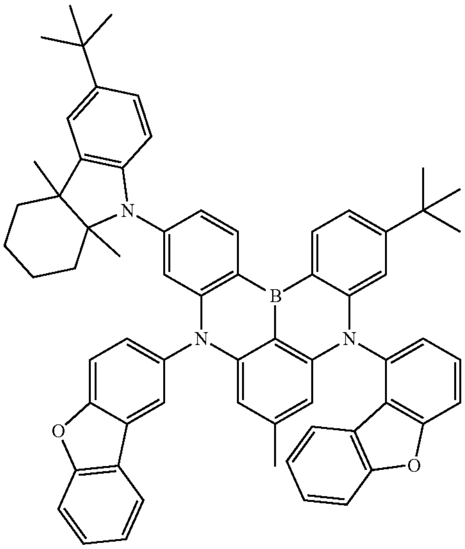 [SMILES: Cc1cc2c3c(c1)N(c1cccc4oc5ccccc5c14)c1cc(C(C)(C)C)ccc1B3c1ccc(N3c4ccc(C(C)(C)C)cc4C4(C)CCCCC34C)cc1N2c1ccc2sc3ccccc3c2c1]
-continued
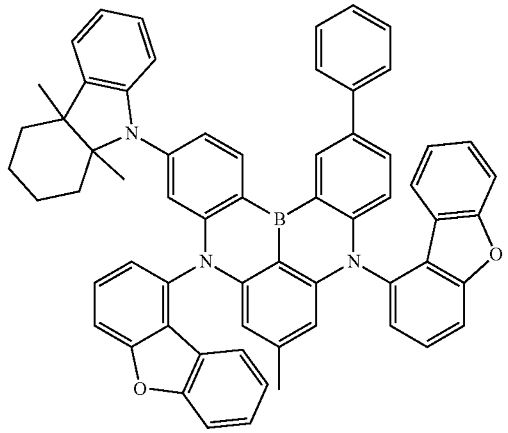
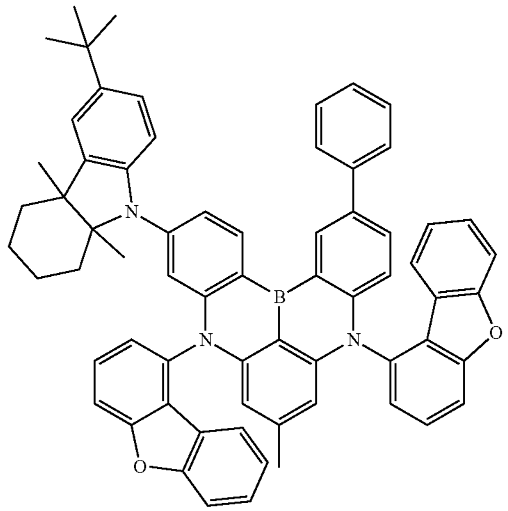
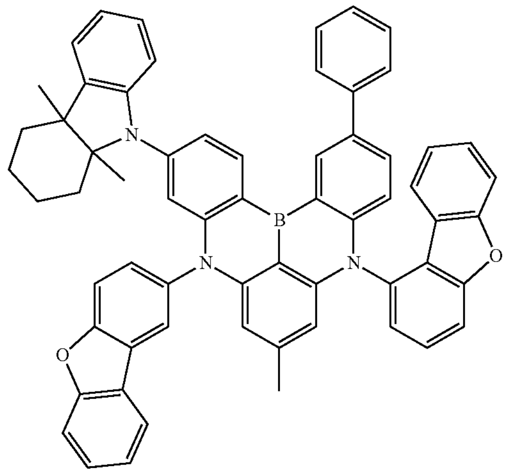

-continued
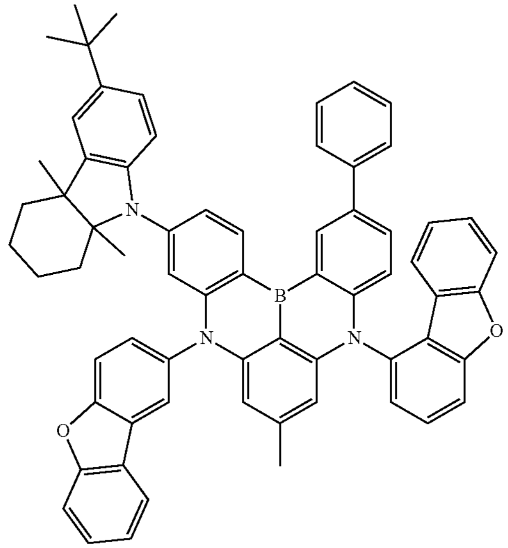 [SMILES: Cc1cc2c3c(c1)N(c1cccc4oc5ccccc5c14)c1ccc(-c4ccccc4)cc1B3c1ccc(N3c4ccc(C(C)(C)C)cc4C4(C)CCCCC34C)cc1N2c1ccc2sc3ccccc3c2c1]
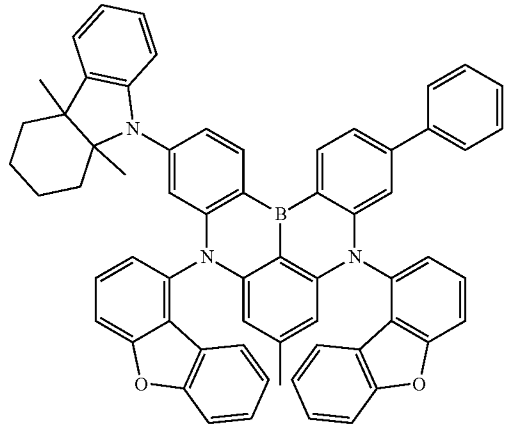
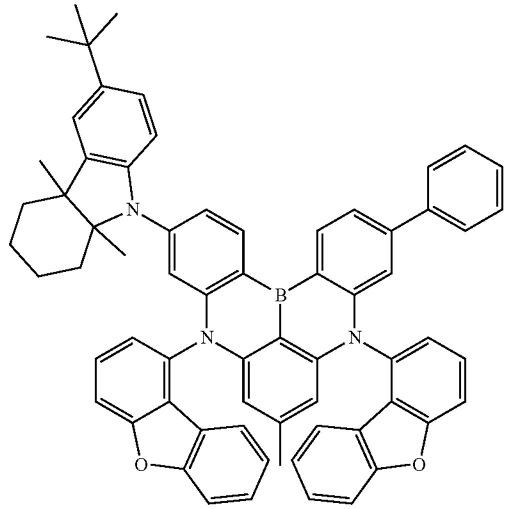
-continued
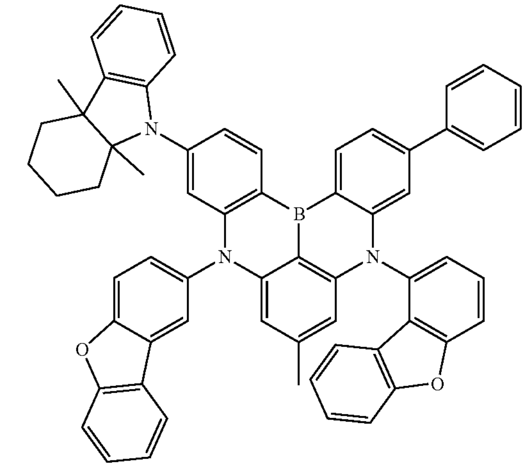
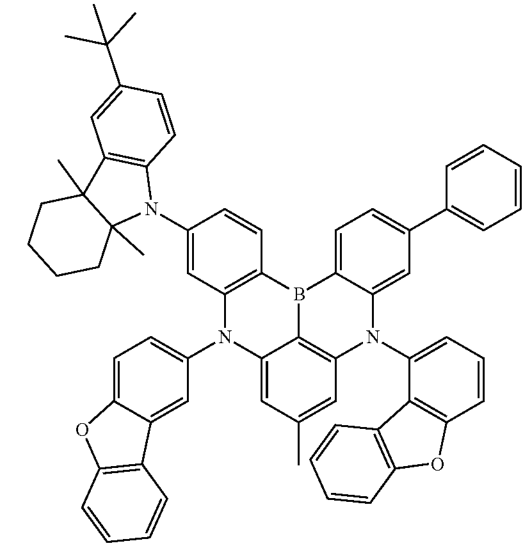 [SMILES: Cc1cc2c3c(c1)N(c1cccc4oc5ccccc5c14)c1cc(-c4ccccc4)ccc1B3c1ccc(N3c4ccc(C(C)(C)C)cc4C4(C)CCCCC34C)cc1N2c1ccc2sc3ccccc3c2c1]
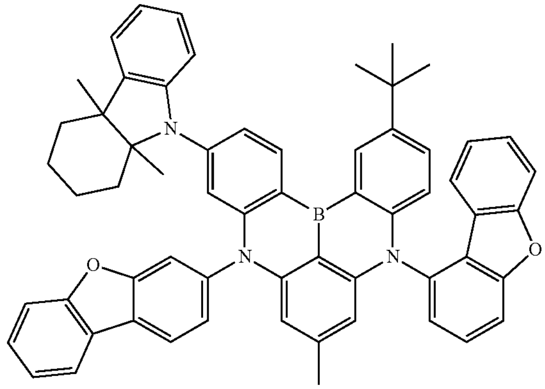

-continued
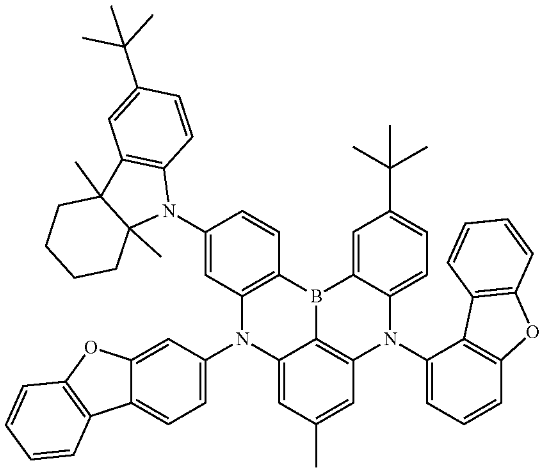
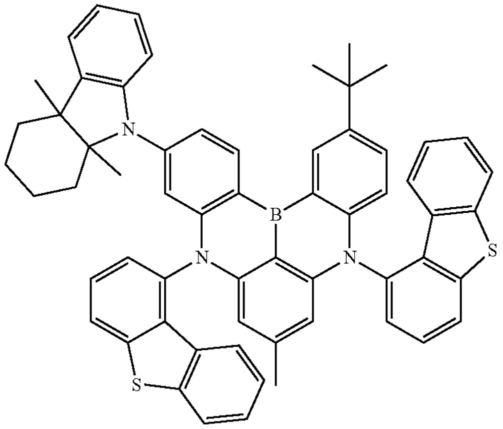
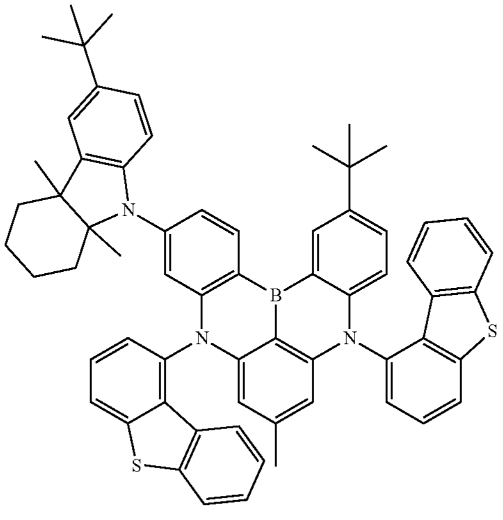
-continued
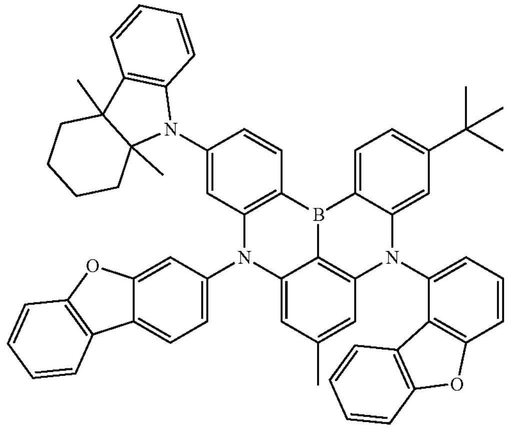
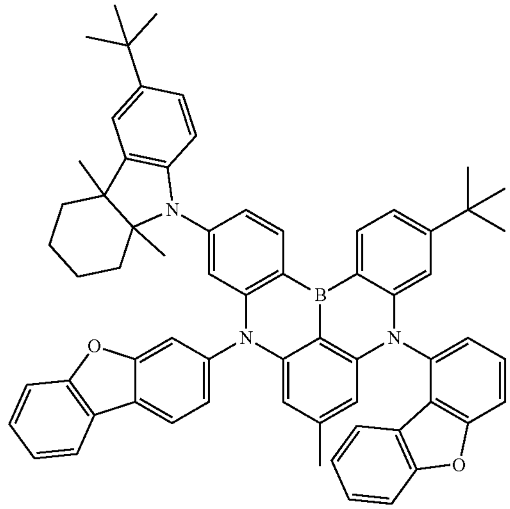
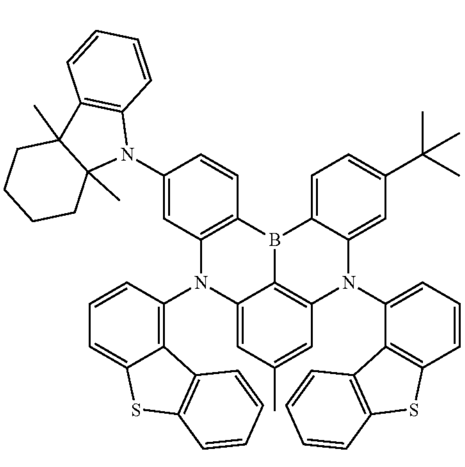

-continued
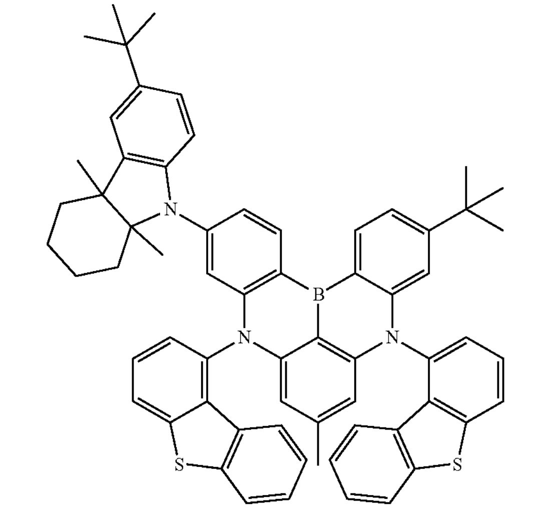
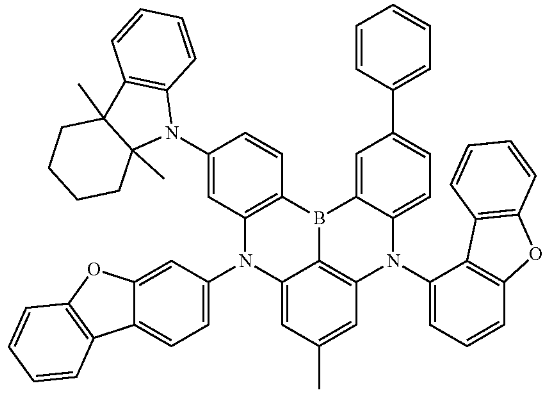
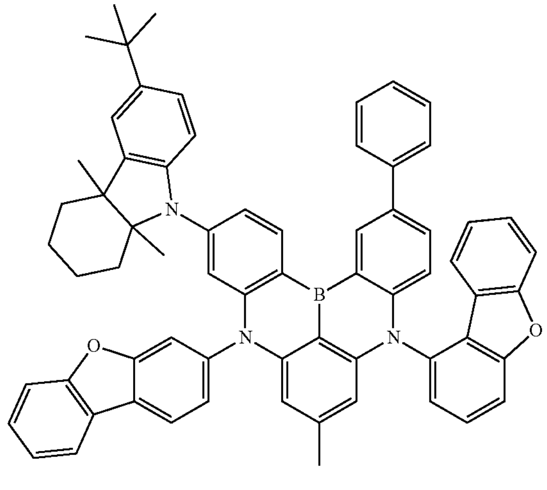
-continued
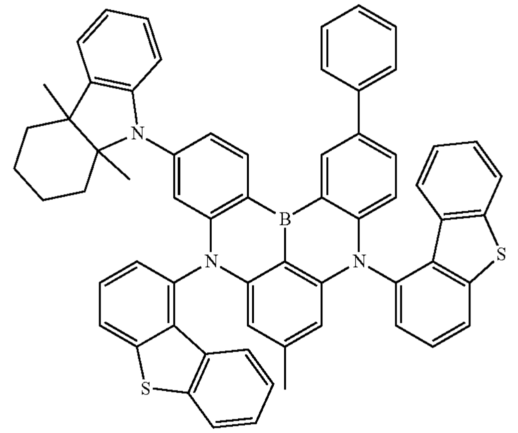
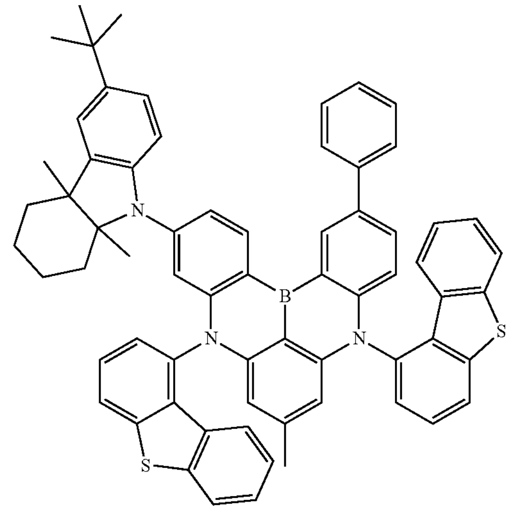
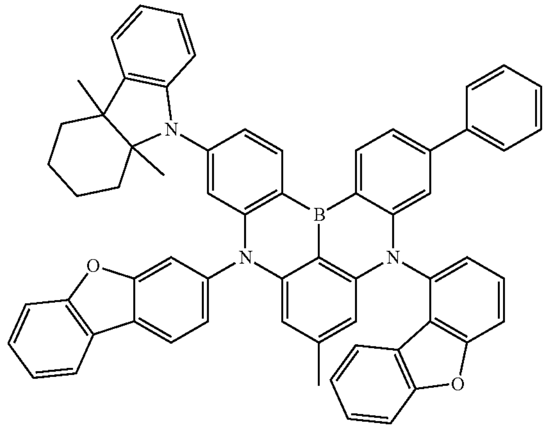

-continued
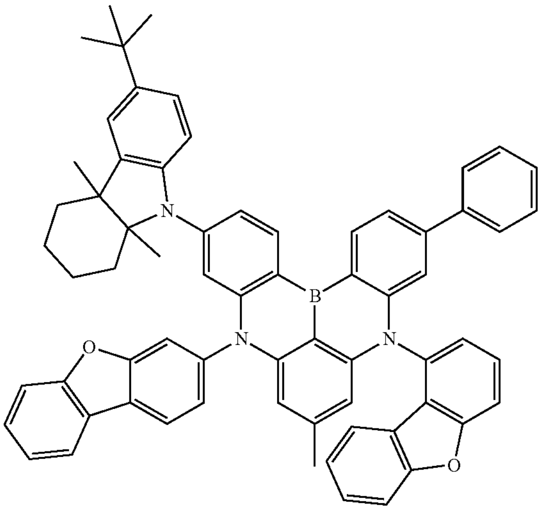
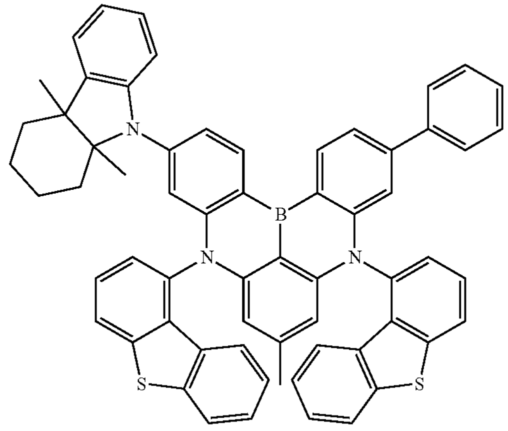
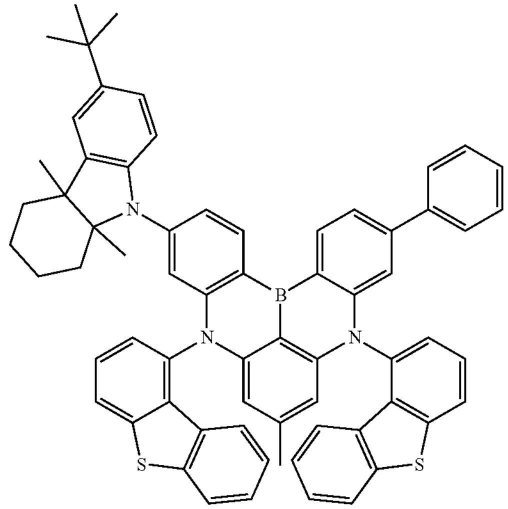
-continued
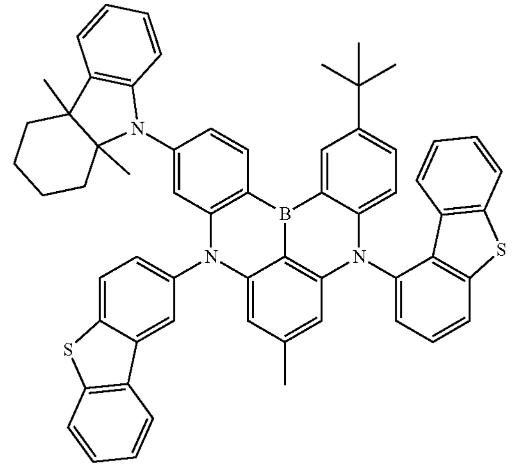
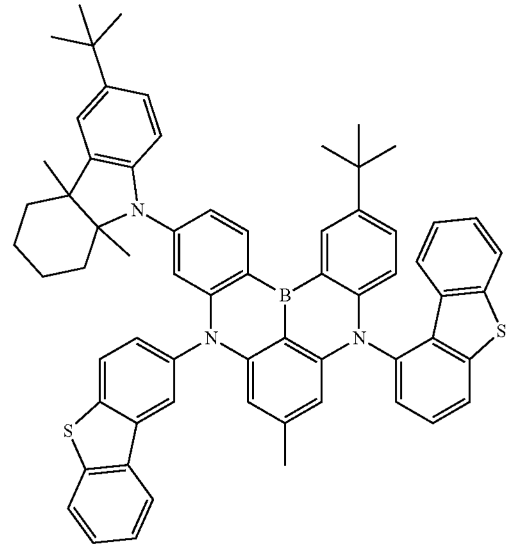
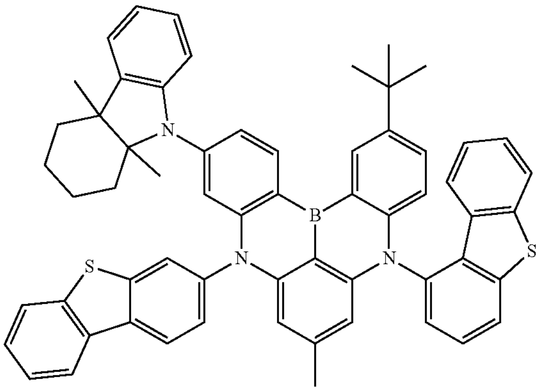

-continued
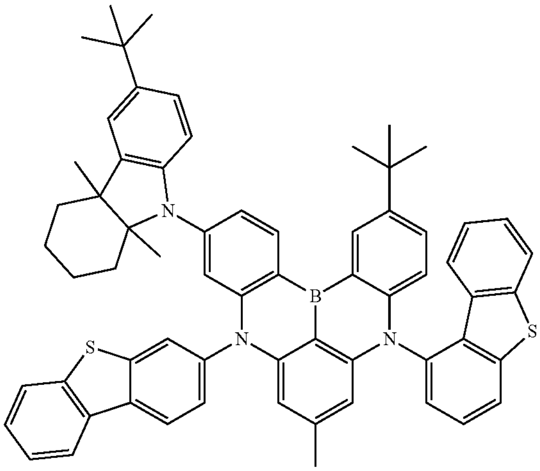
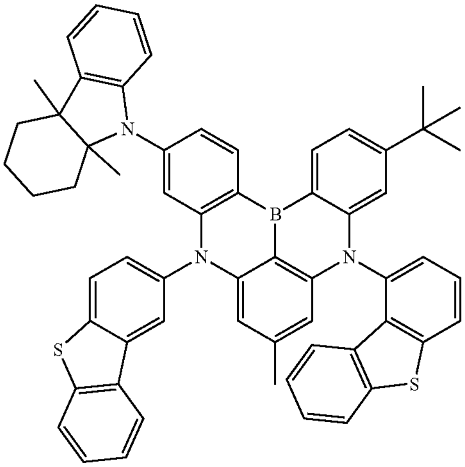
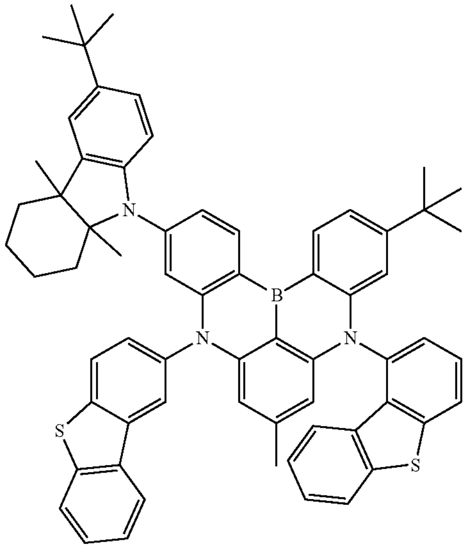
-continued
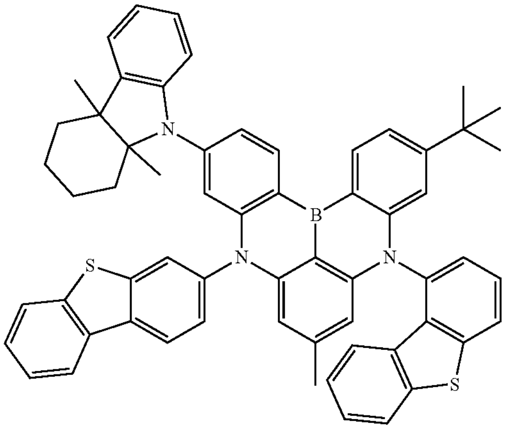
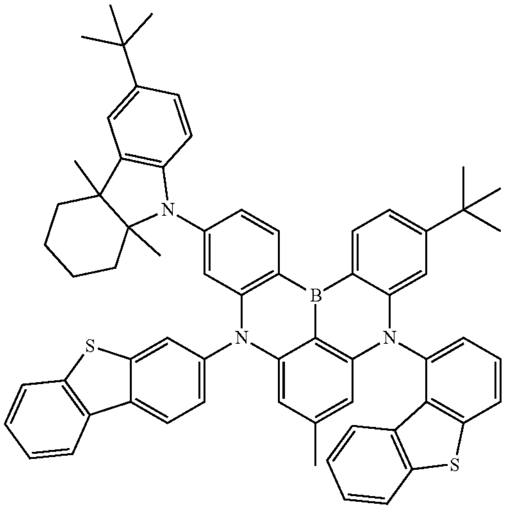
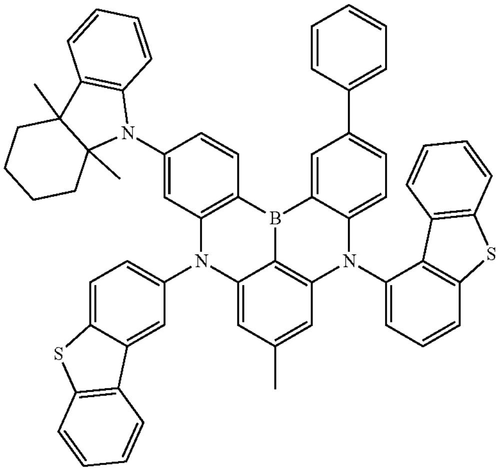

-continued
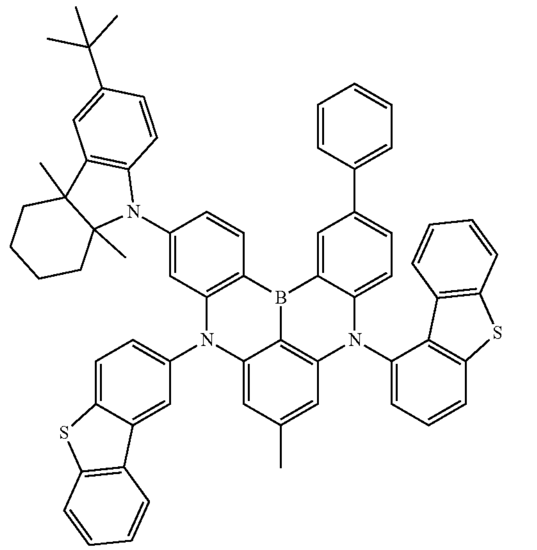
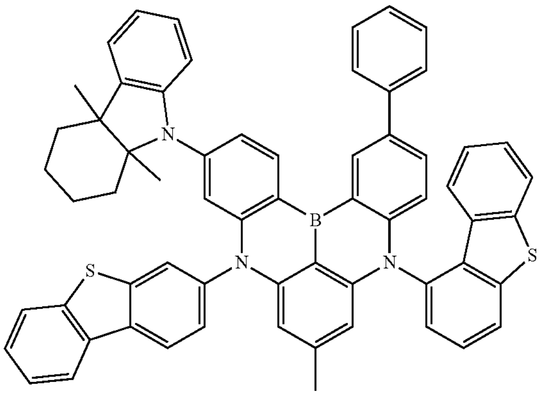
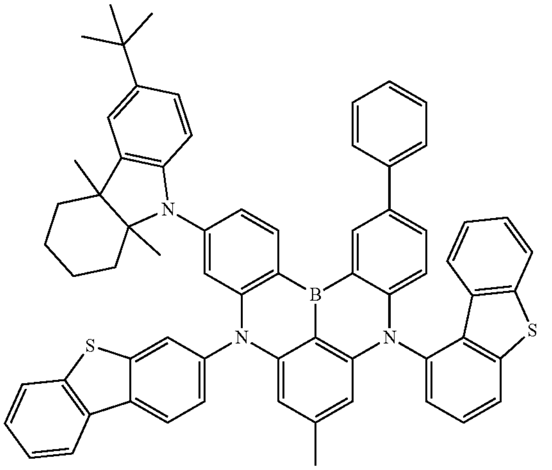
-continued
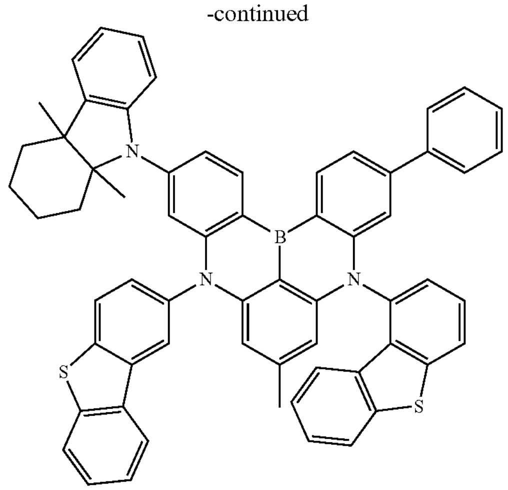
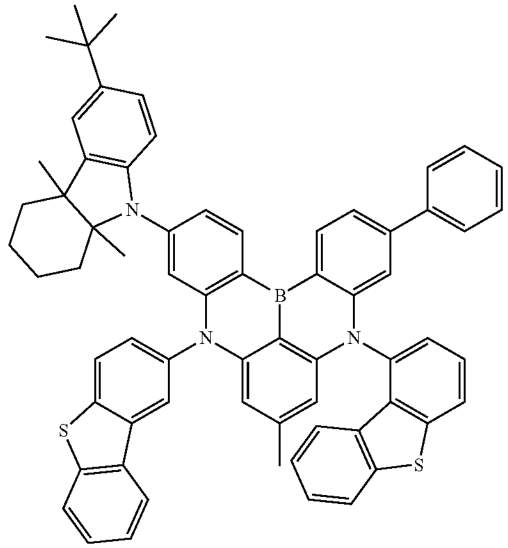
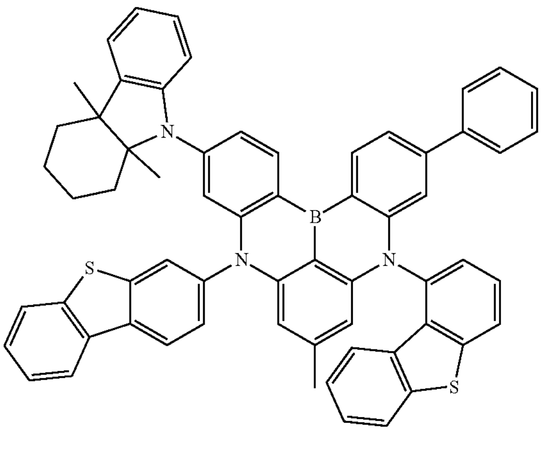

-continued
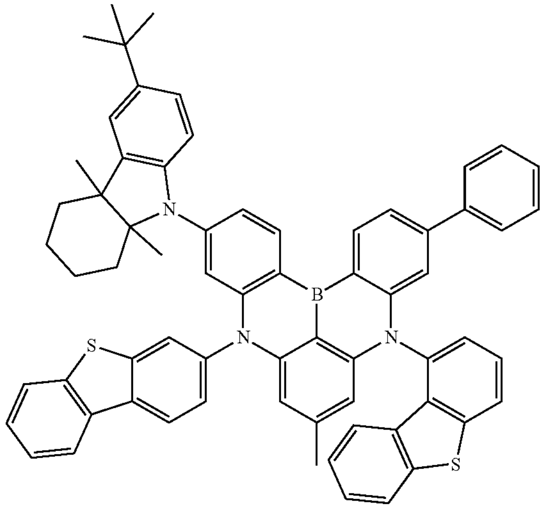
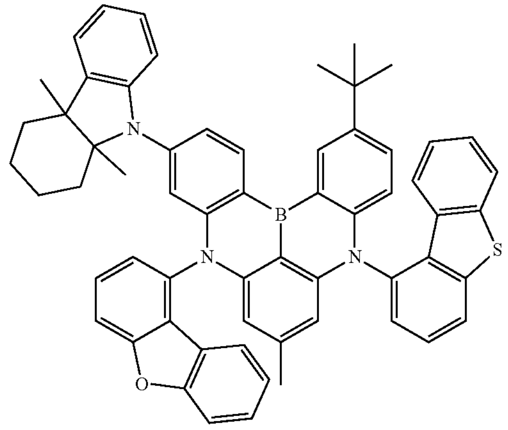
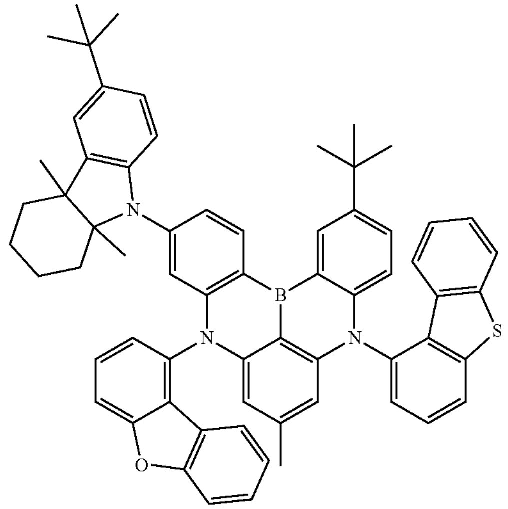
-continued
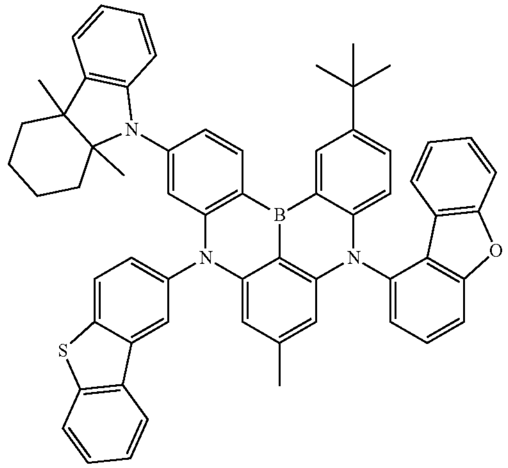
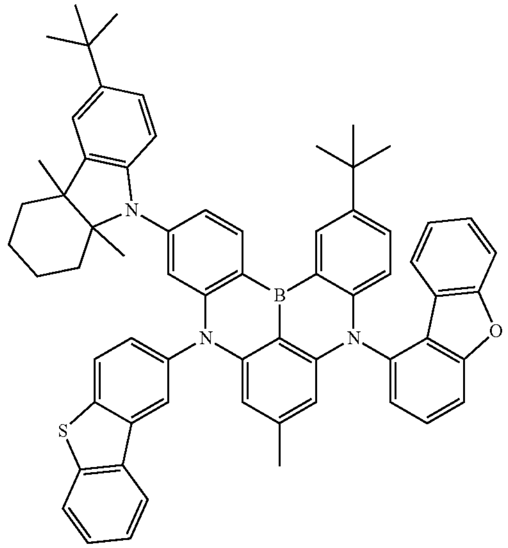
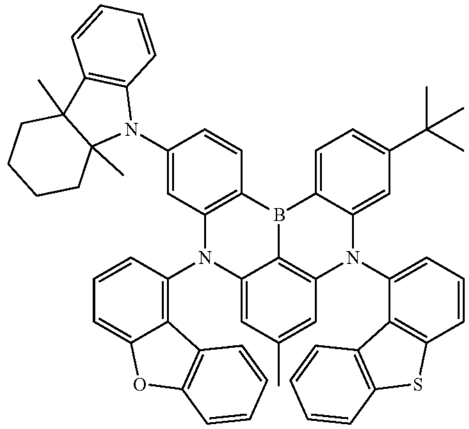

-continued
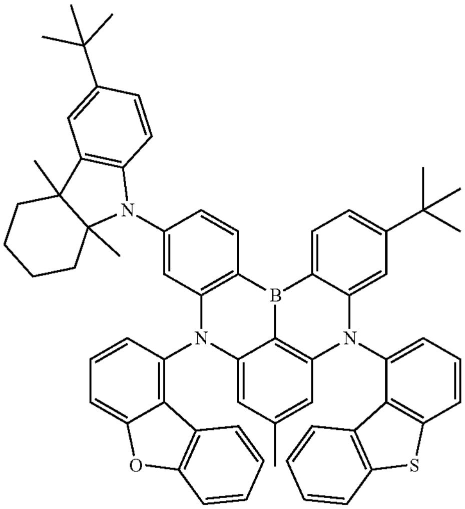
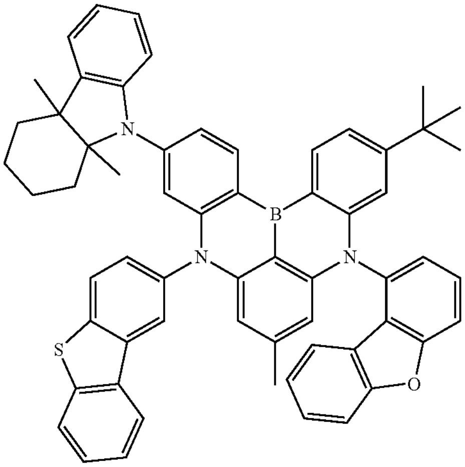
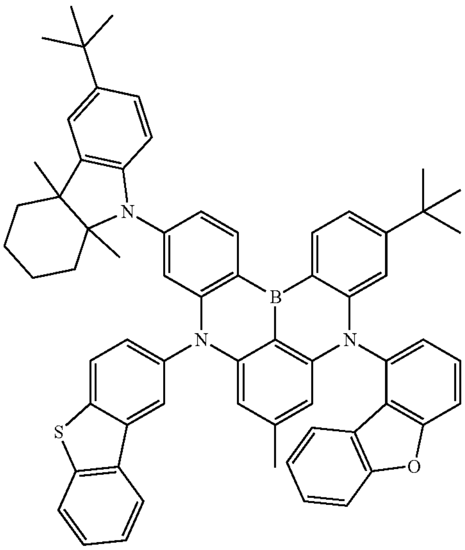
-continued
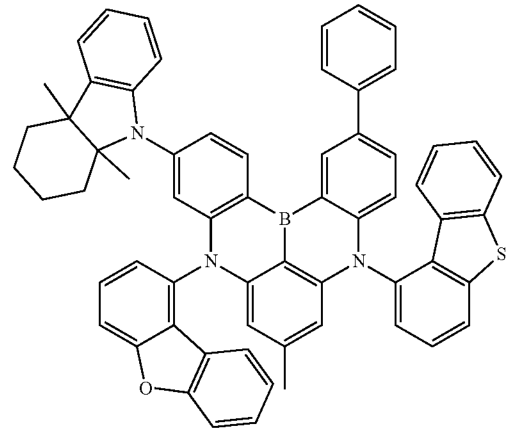
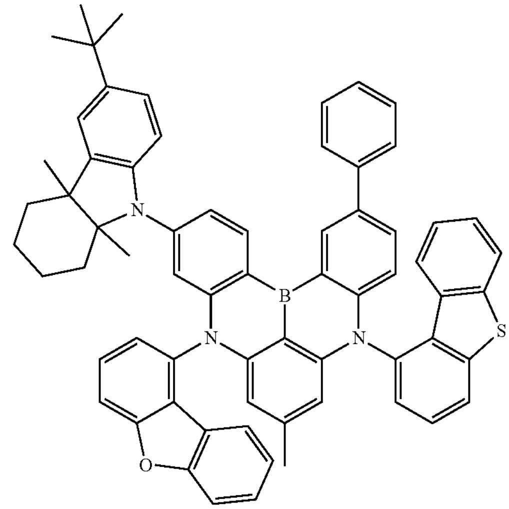
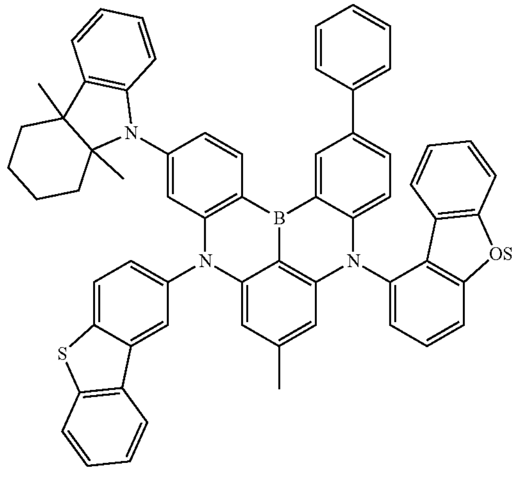

-continued
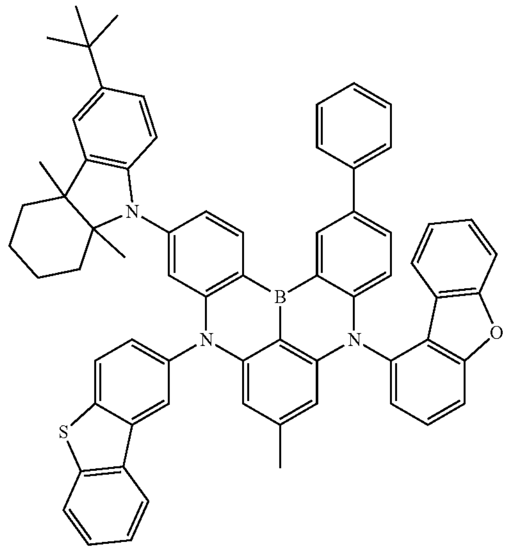
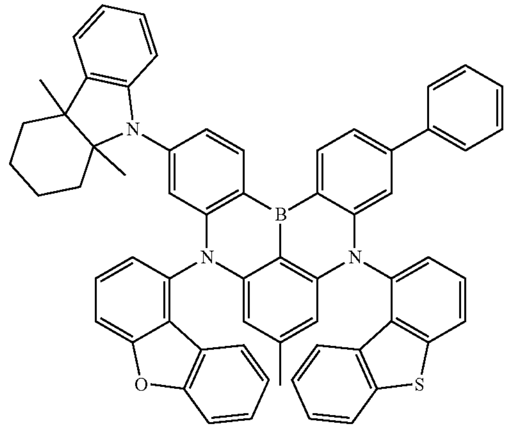
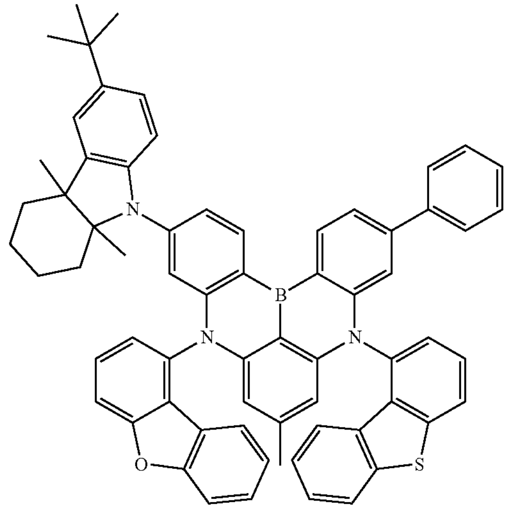
-continued
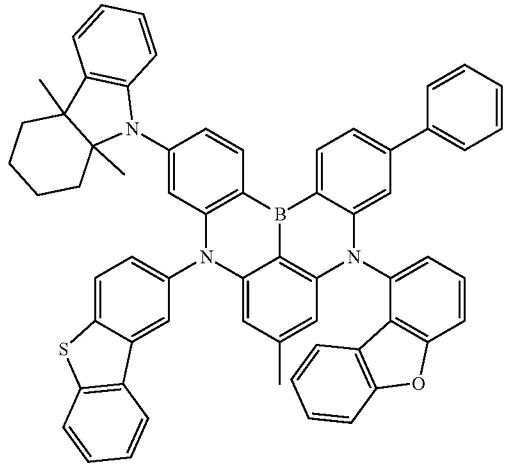
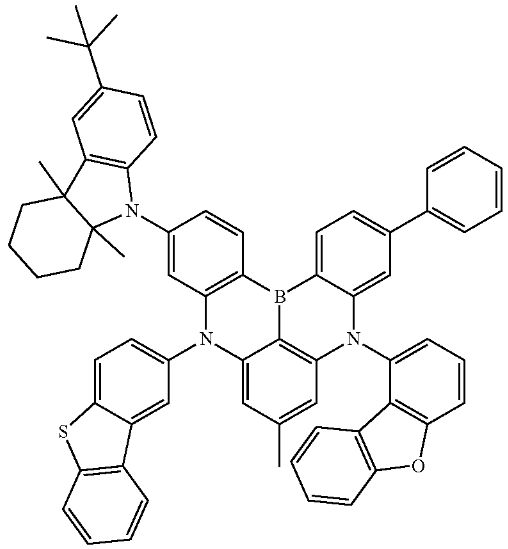
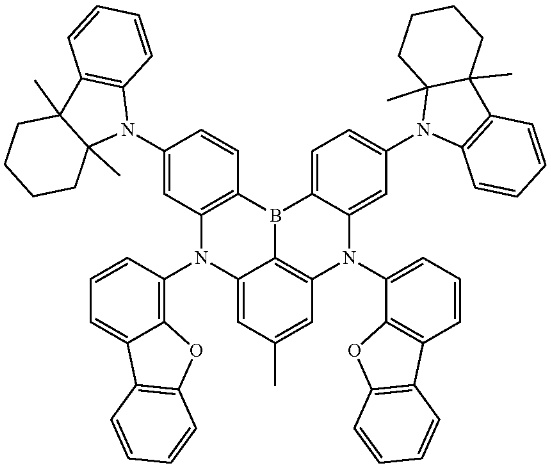

-continued
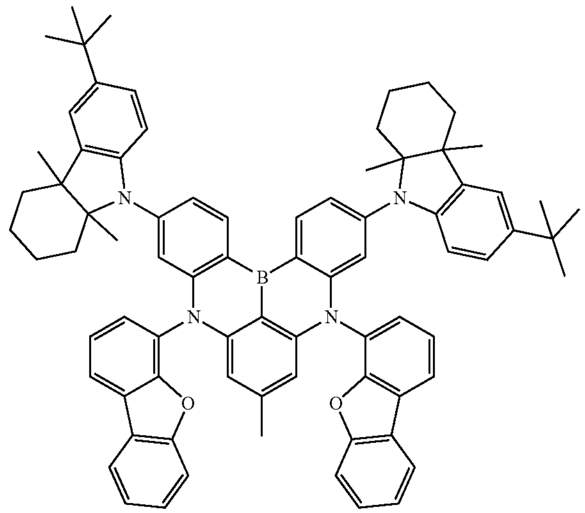
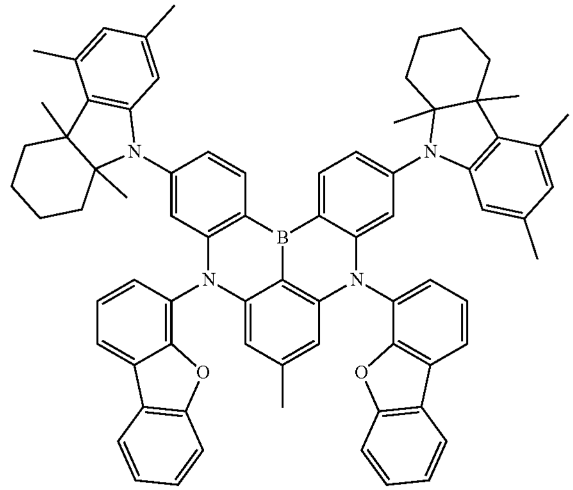
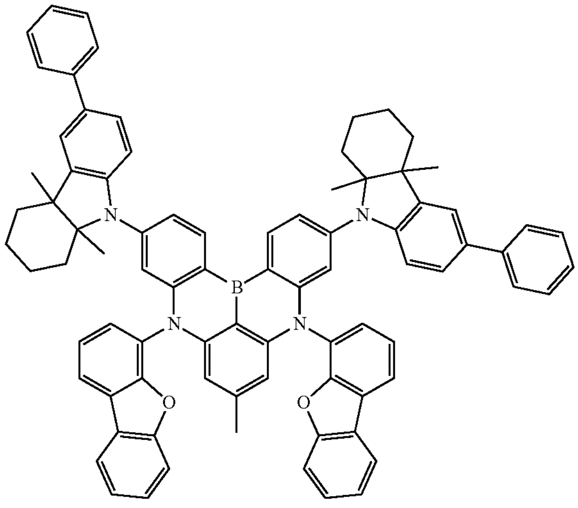 [SMILES: Cc1cc2c3c(c1)N(c1cccc4c1oc1ccccc14)c1cc(N4c5ccc(-c6ccccc6)cc5C5(C)CCCCC45C)ccc1B3c1ccc(N3c4ccc(-c5ccccc5)cc4C4(C)CCCCC34C)cc1N2c1cccc2c1oc1ccccc12]
-continued
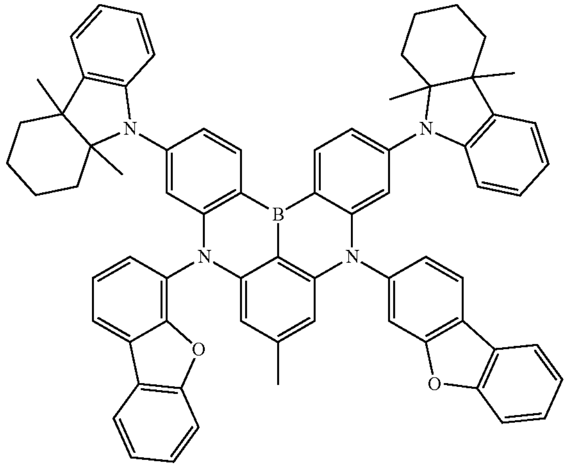
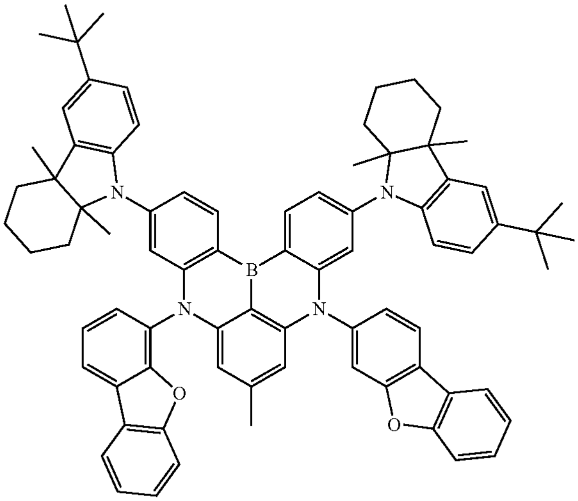
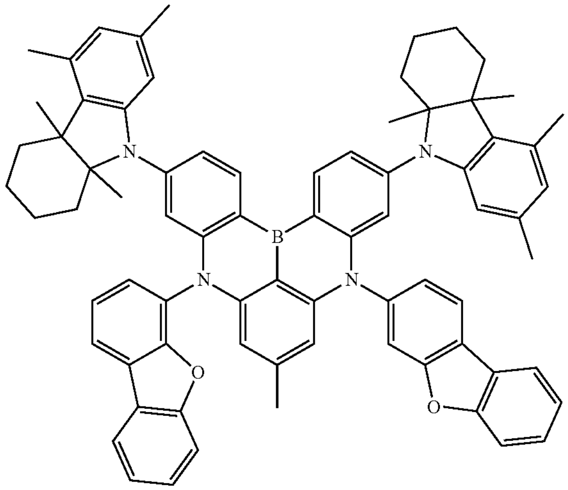

-continued
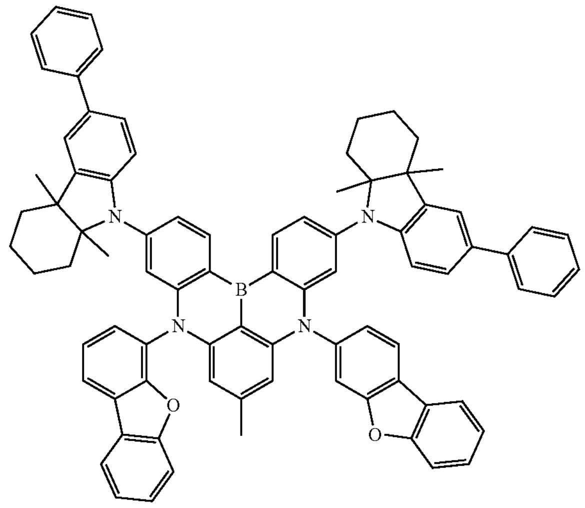
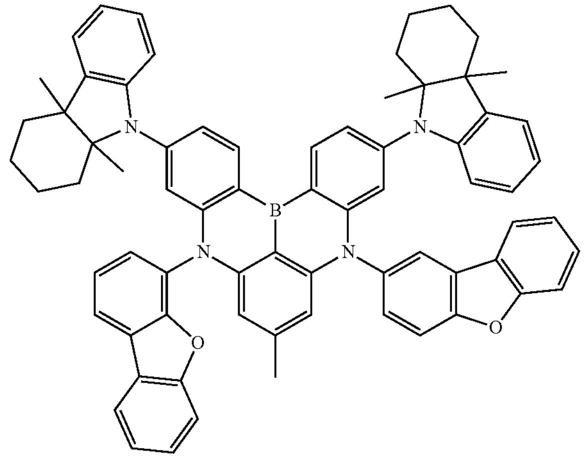
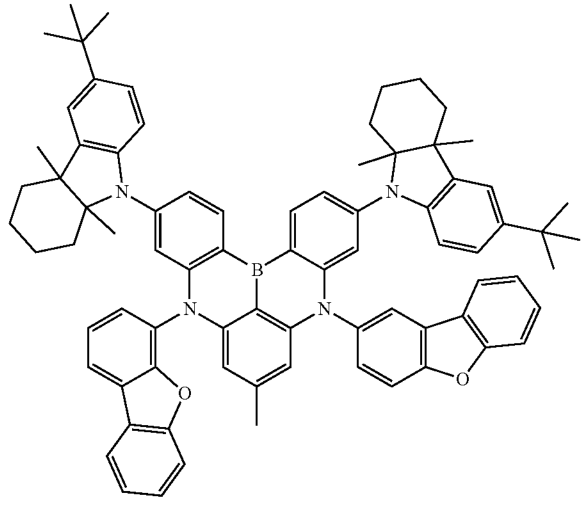
-continued
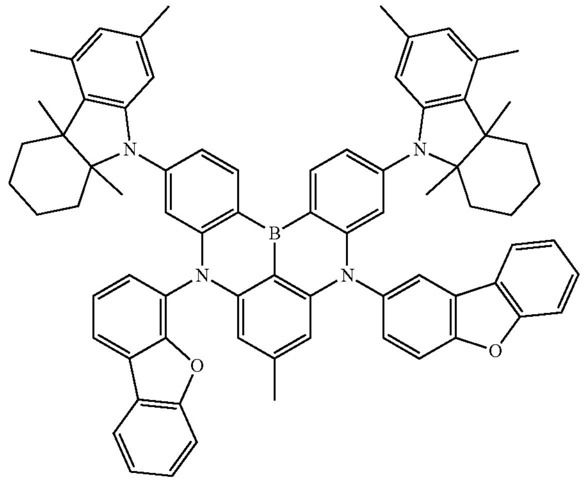
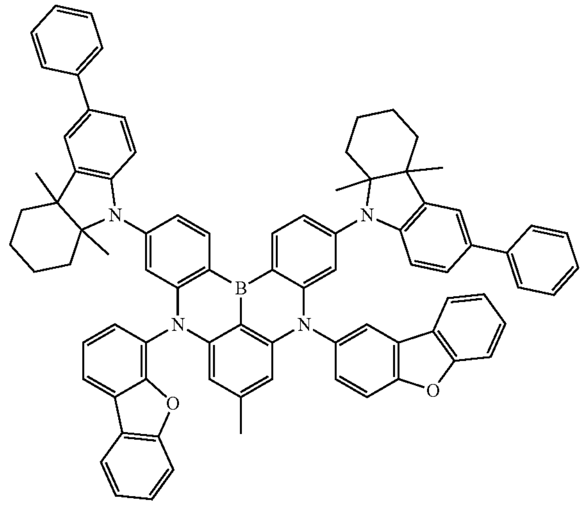 [SMILES: Cc1cc2c3c(c1)N(c1cccc4c1oc1ccccc14)c1cc(N4c5ccc(-c6ccccc6)cc5C5(C)CCCCC45C)ccc1B3c1ccc(N3c4ccc(-c5ccccc5)cc4C4(C)CCCCC34C)cc1N2c1ccc2oc3ccccc3c2c1]
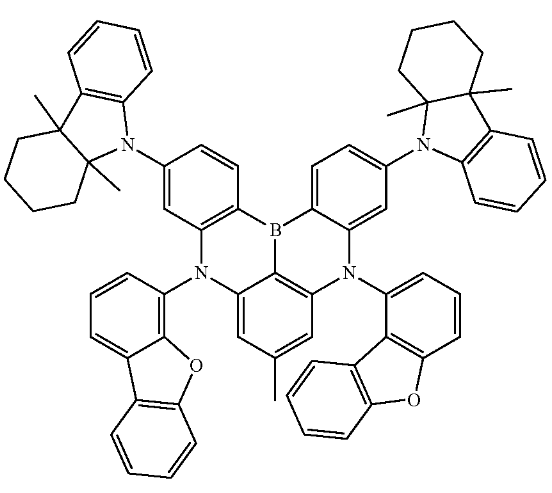

-continued
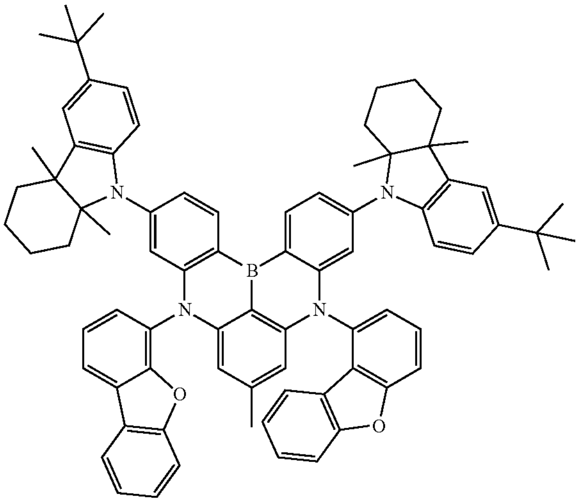
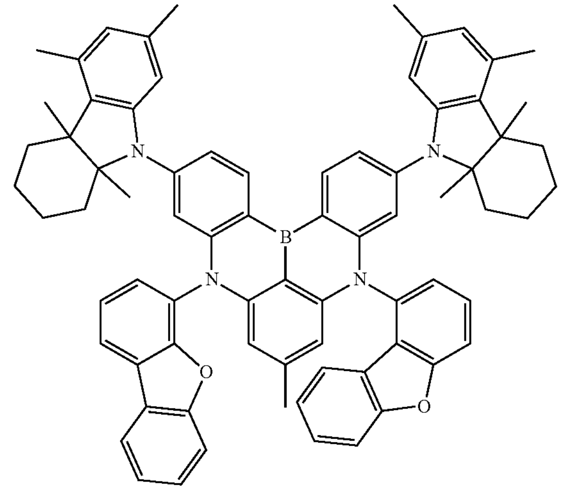
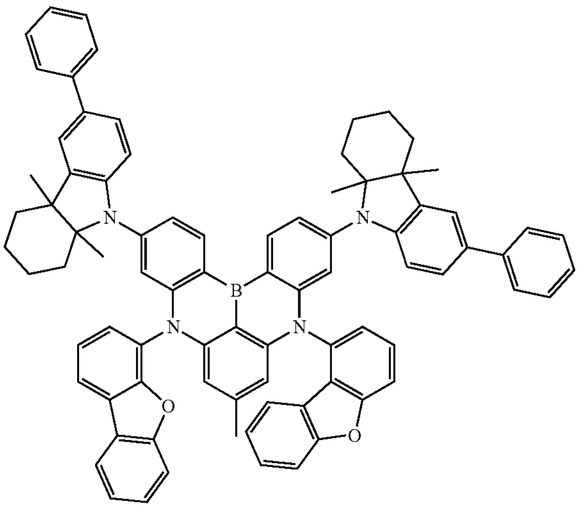
-continued
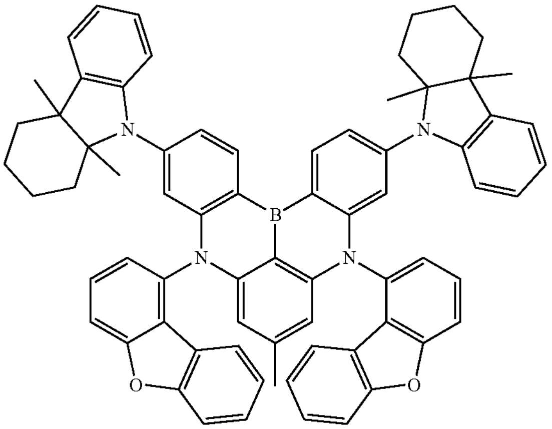
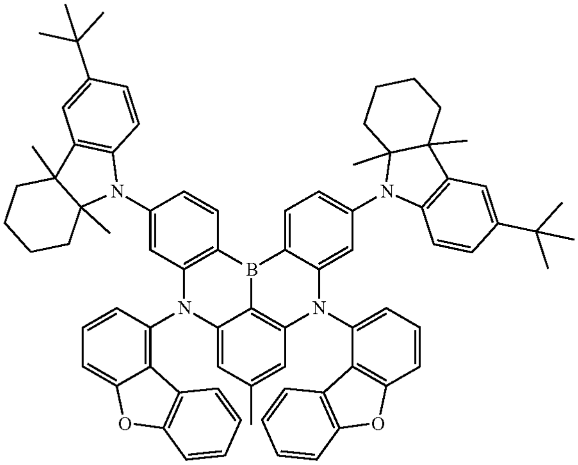
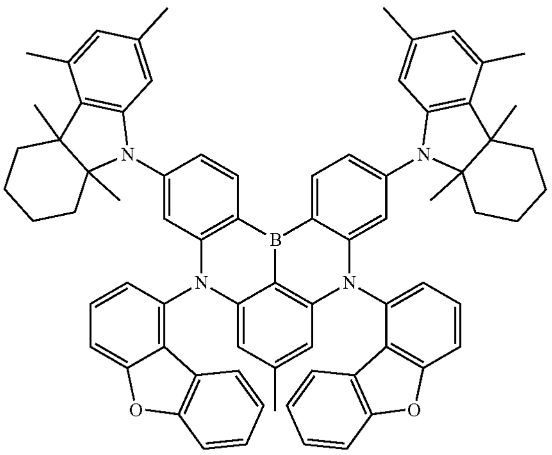

-continued
-continued
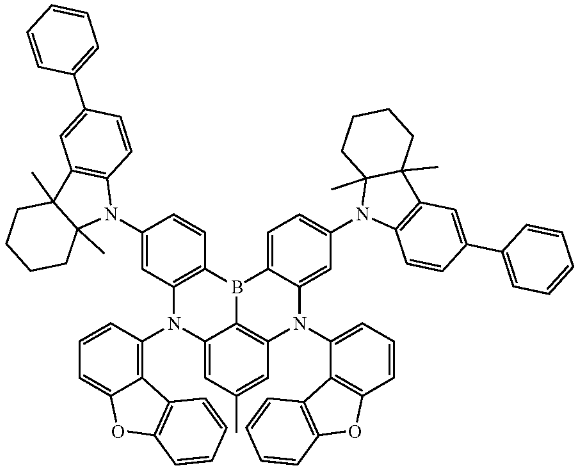
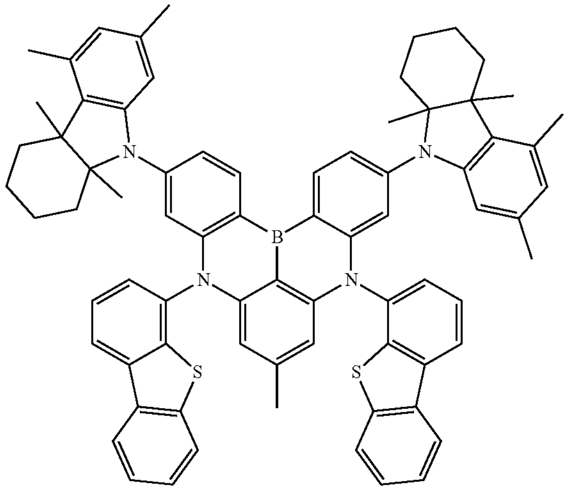
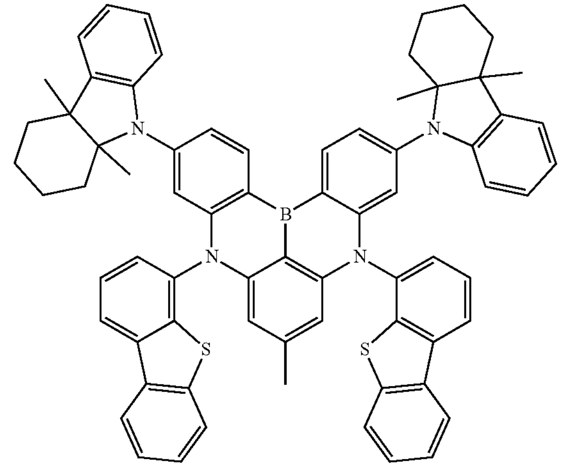
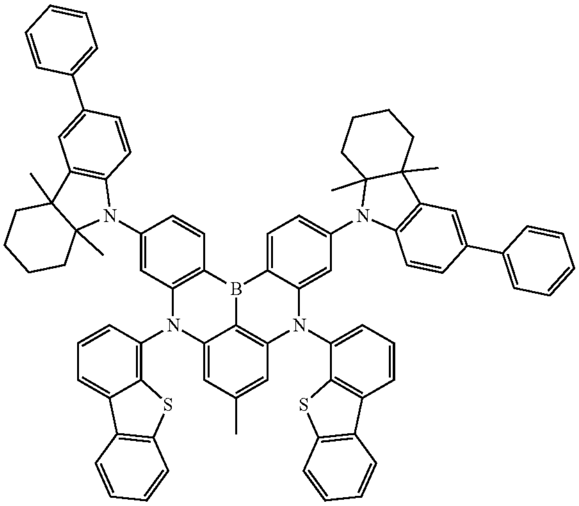
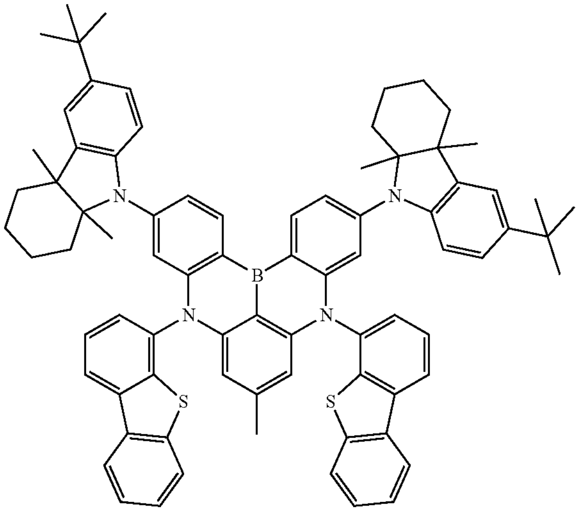
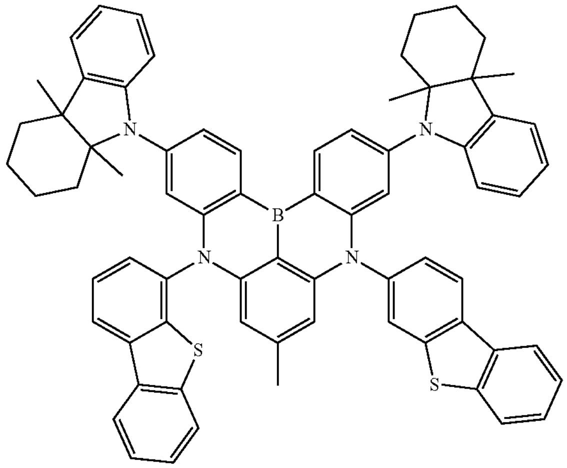

-continued
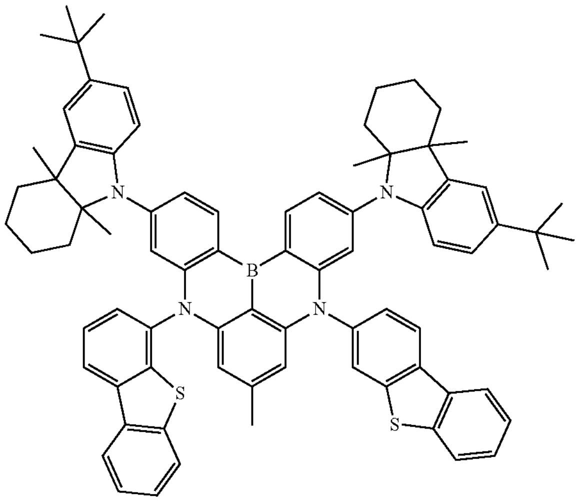
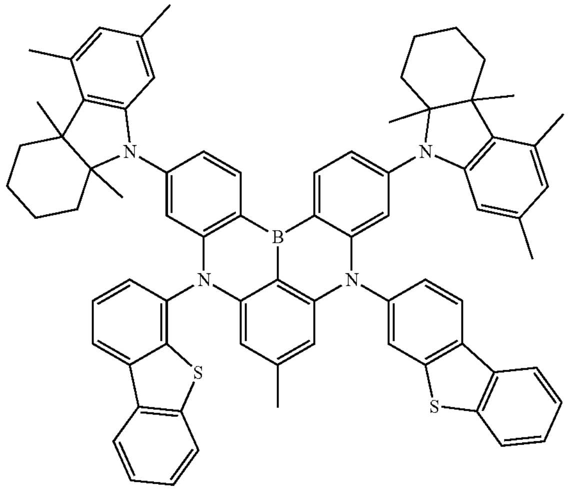
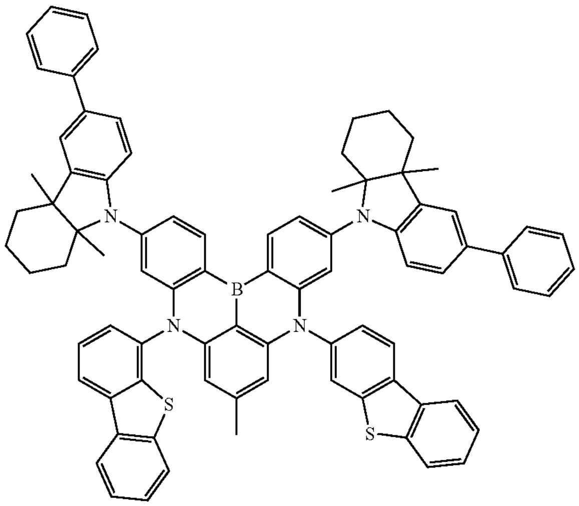
-continued
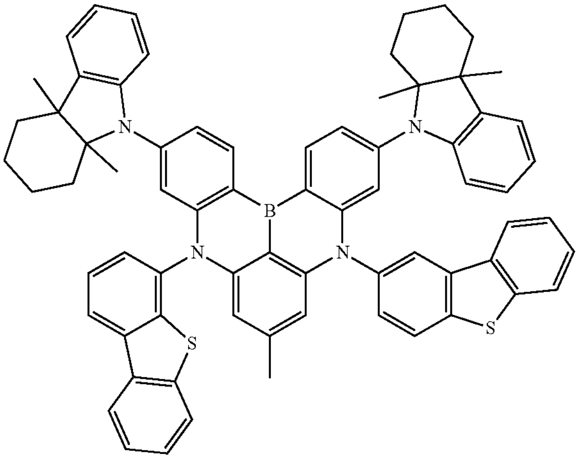
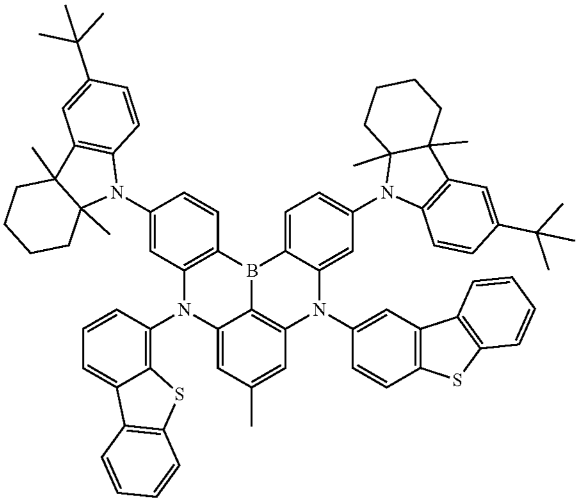
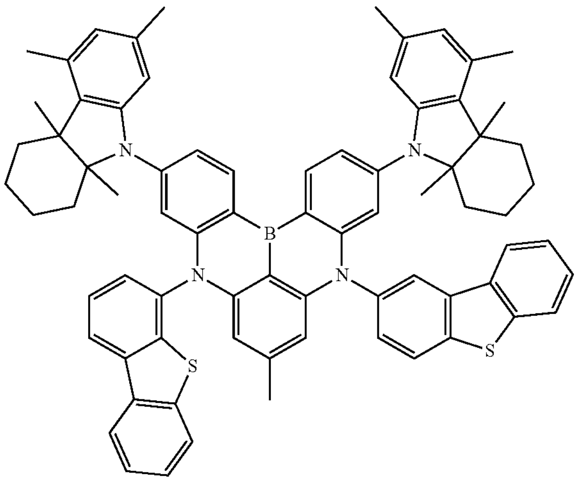

-continued
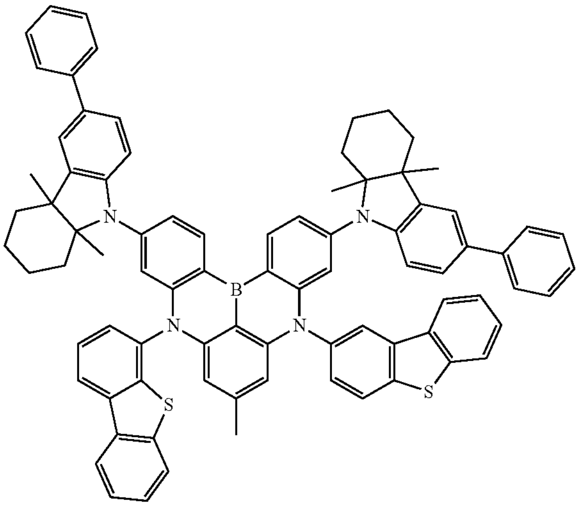
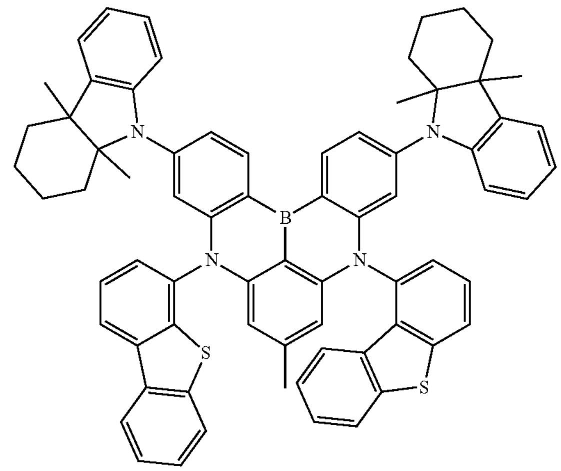
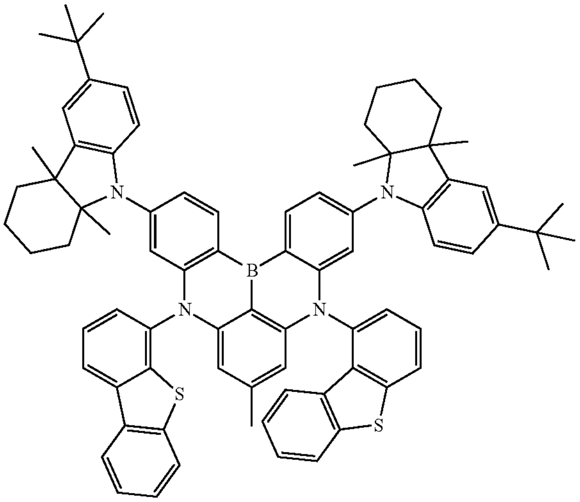
-continued
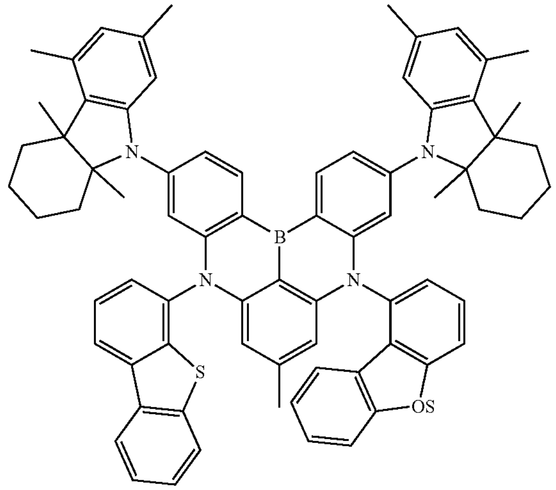
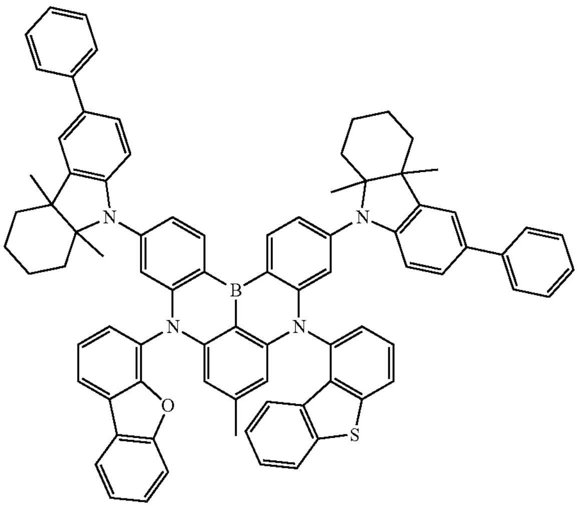 [SMILES: Cc1cc2c3c(c1)N(c1cccc4oc5ccccc5c14)c1cc(N4c5ccc(-c6ccccc6)cc5C5(C)CCCCC45C)ccc1B3c1ccc(N3c4ccc(-c5ccccc5)cc4C4(C)CCCCC34C)cc1N2c1cccc2c1oc1ccccc12]
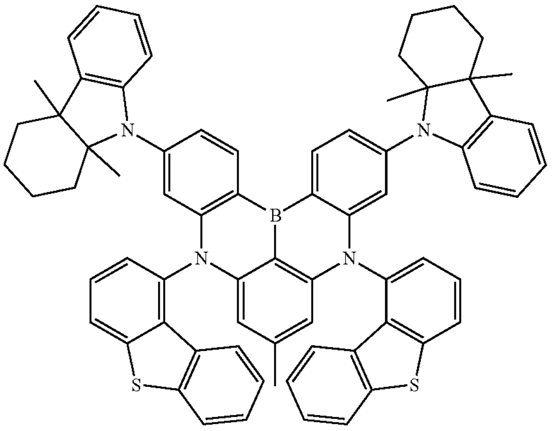

-continued
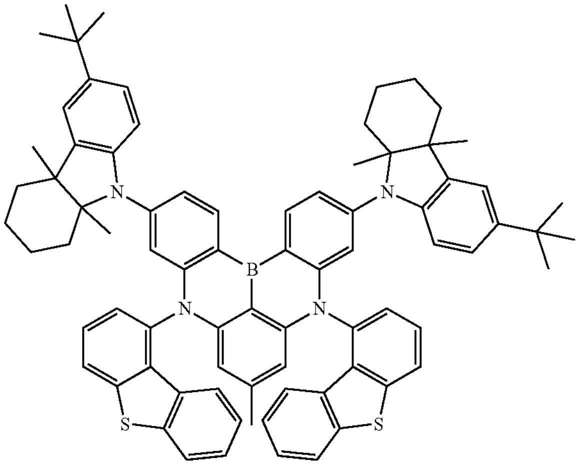
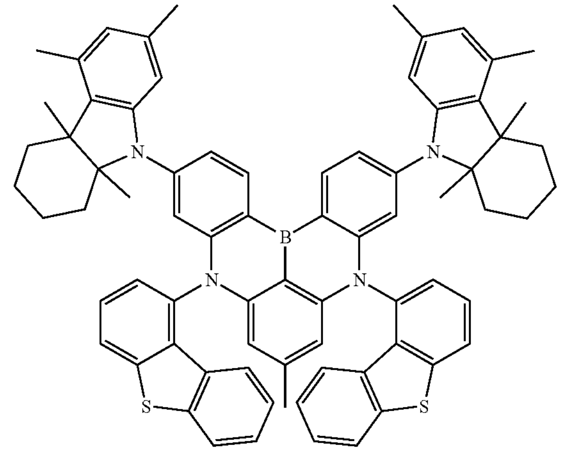
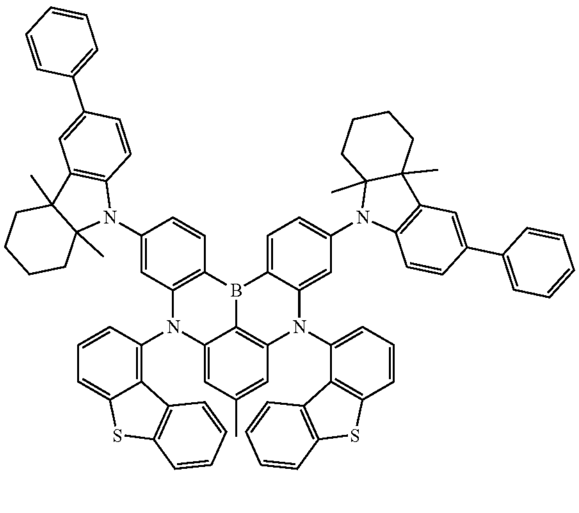 [SMILES: Cc1cc2c3c(c1)N(c1cccc4oc5ccccc5c14)c1cc(N4c5ccc(-c6ccccc6)cc5C5(C)CCCCC45C)ccc1B3c1ccc(N3c4ccc(-c5ccccc5)cc4C4(C)CCCCC34C)cc1N2c1cccc2oc3ccccc3c12]
-continued
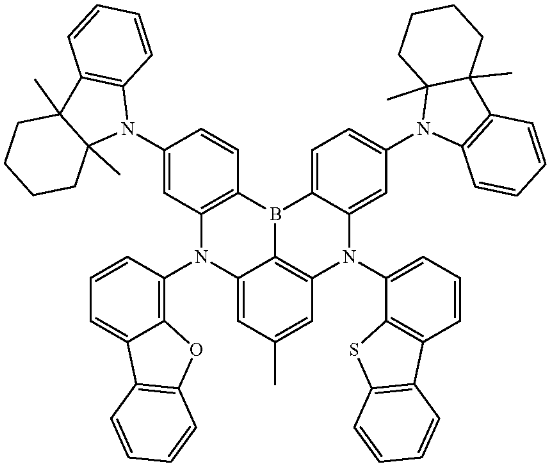
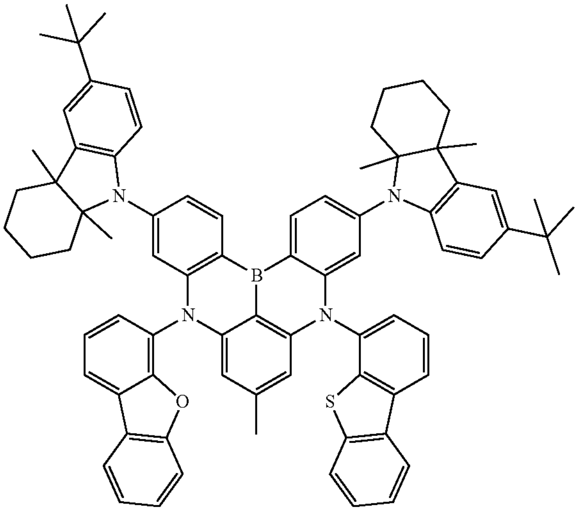
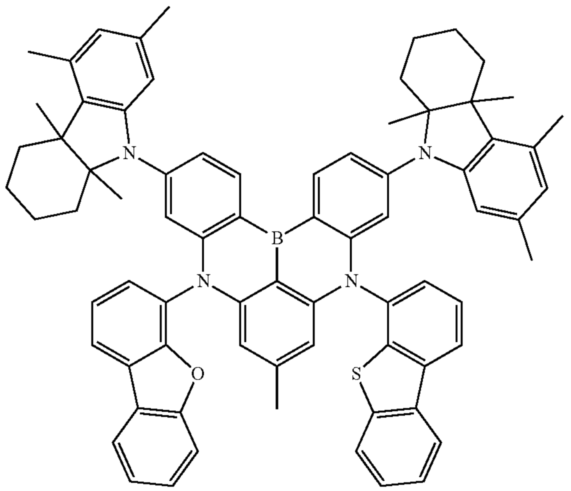

-continued
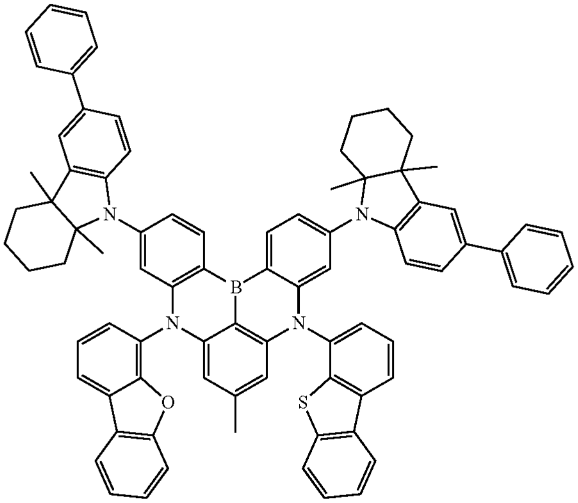 [SMILES: Cc1cc2c3c(c1)N(c1cccc4c1sc1ccccc14)c1cc(N4c5ccc(-c6ccccc6)cc5C5(C)CCCCC45C)ccc1B3c1ccc(N3c4ccc(-c5ccccc5)cc4C4(C)CCCCC34C)cc1N2c1cccc2c1sc1ccccc12]
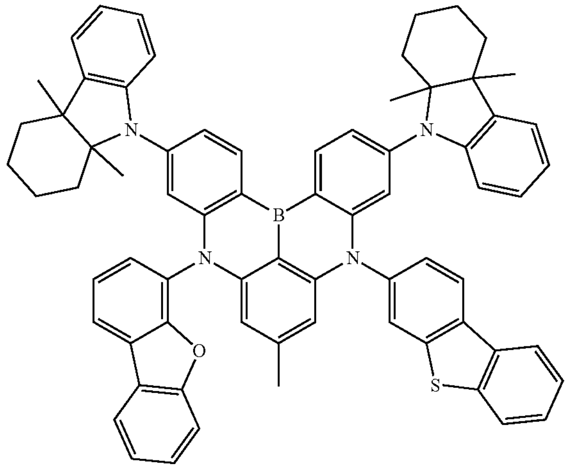
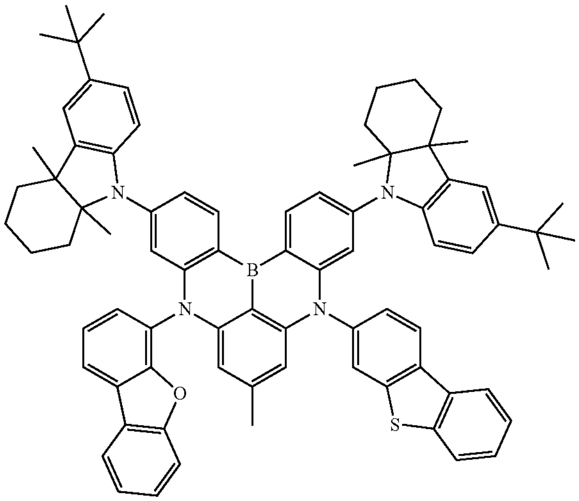
-continued
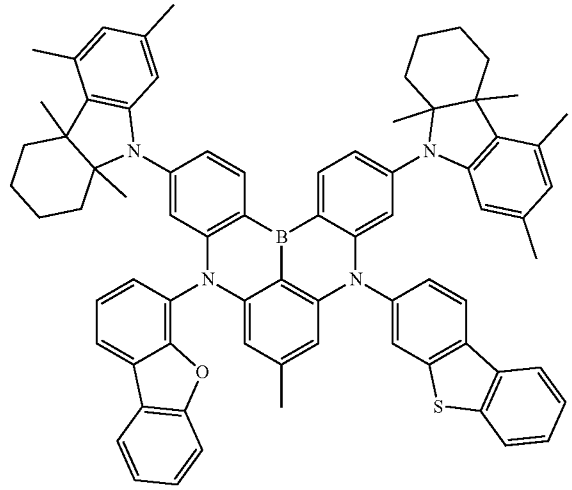
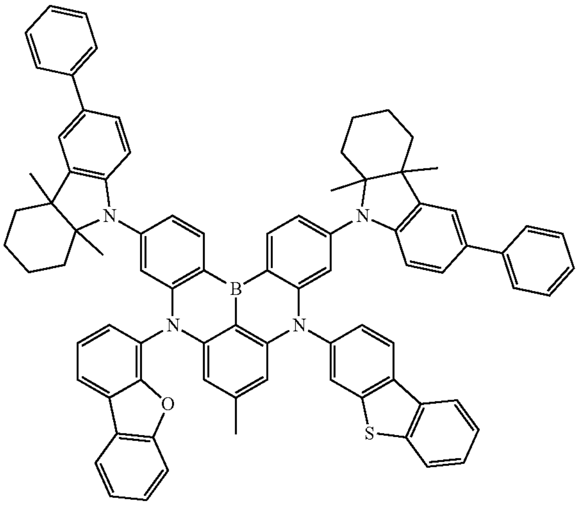 [SMILES: Cc1cc2c3c(c1)N(c1cccc4c1sc1ccccc14)c1cc(N4c5ccc(-c6ccccc6)cc5C5(C)CCCCC45C)ccc1B3c1ccc(N3c4ccc(-c5ccccc5)cc4C4(C)CCCCC34C)cc1N2c1ccc2c(c1)sc1ccccc12]
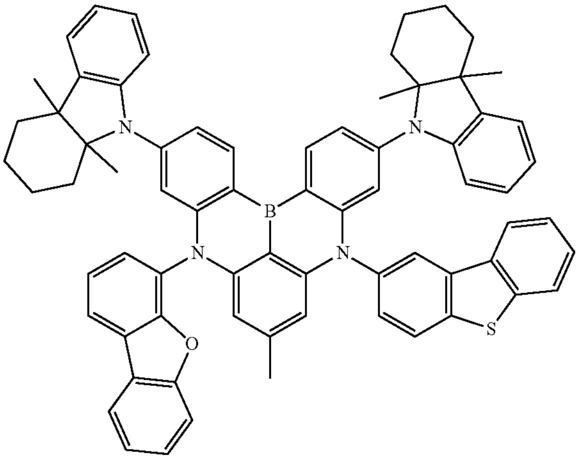

-continued
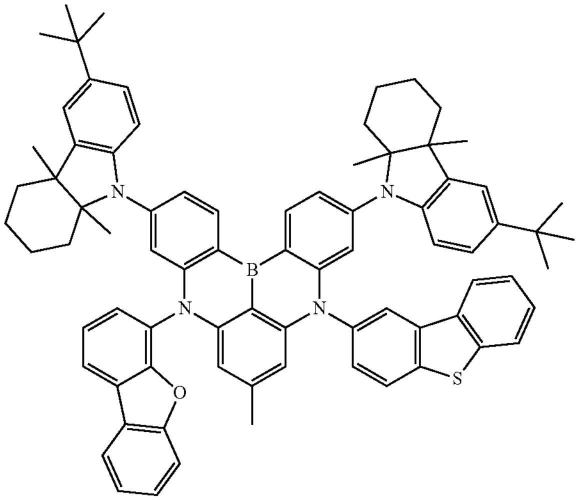
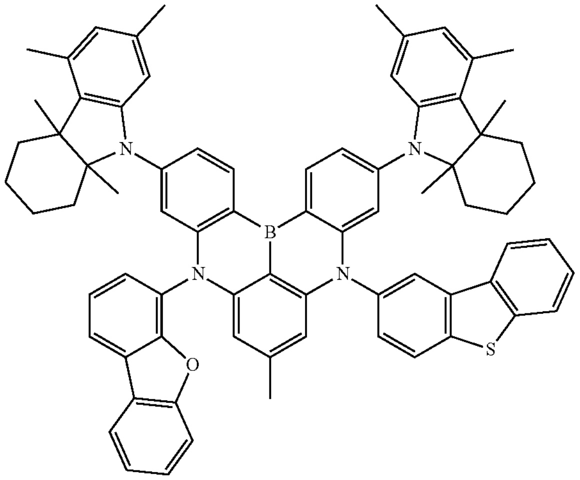
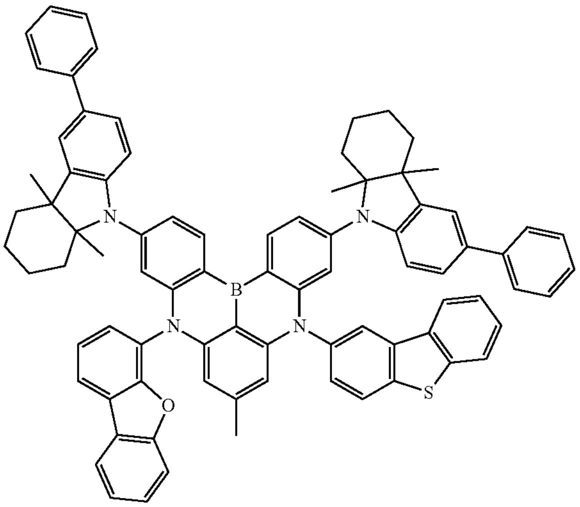 [SMILES: Cc1cc2c3c(c1)N(c1cccc4c1sc1ccccc14)c1cc(N4c5ccc(-c6ccccc6)cc5C5(C)CCCCC45C)ccc1B3c1ccc(N3c4ccc(-c5ccccc5)cc4C4(C)CCCCC34C)cc1N2c1ccc2sc3ccccc3c2c1]
-continued
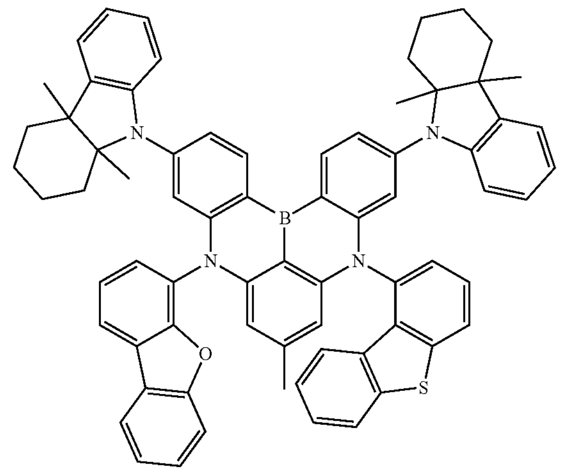
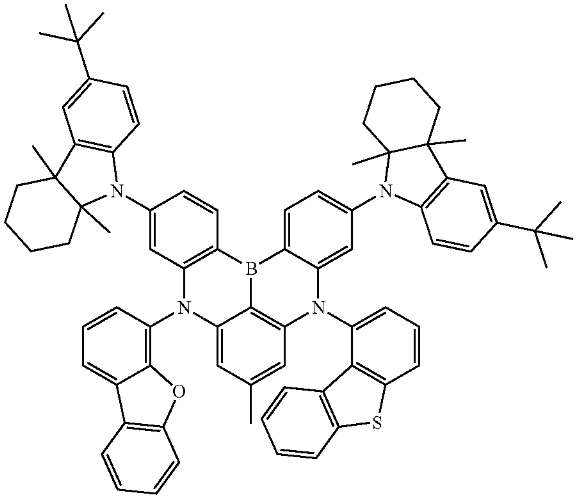
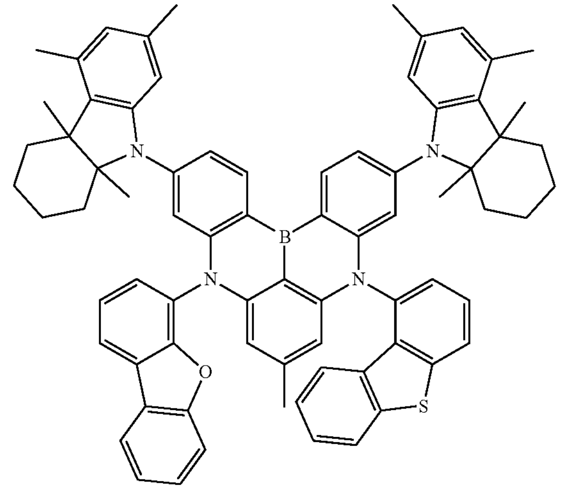

-continued
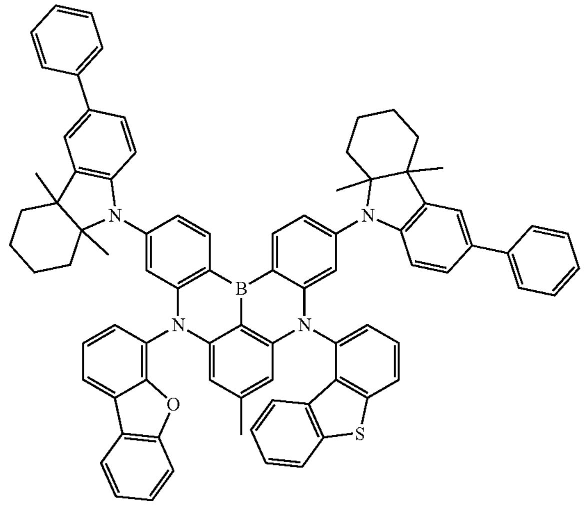
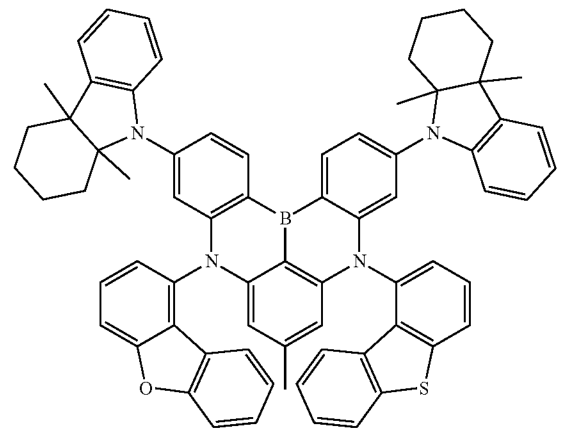
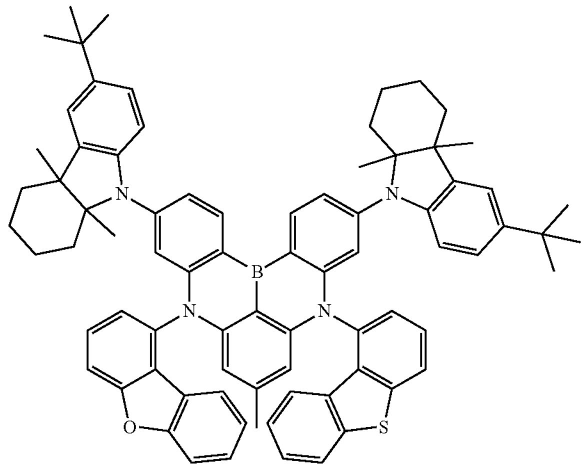
-continued
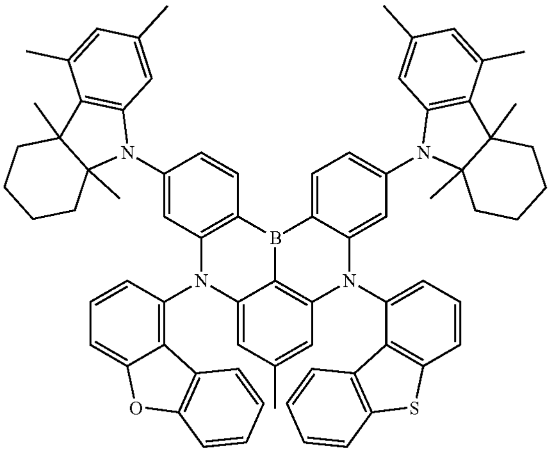
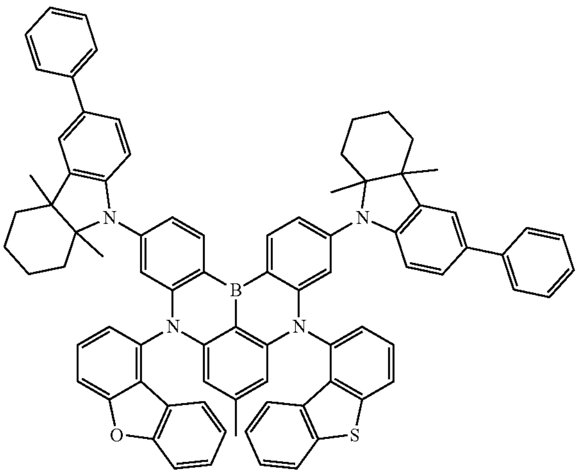
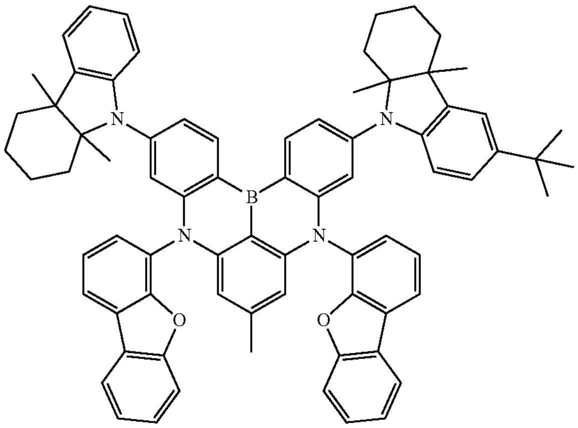

-continued
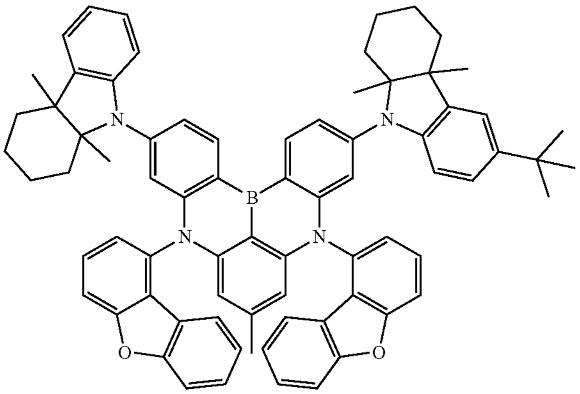 [SMILES: Cc1cc2c3c(c1)N(c1cccc4sc5ccccc5c14)c1cc(N4c5ccc(C(C)(C)C)cc5C5(C)CCCCC45C)ccc1B3c1ccc(N3c4ccccc4C4(C)CCCCC34C)cc1N2c1cccc2sc3ccccc3c12]
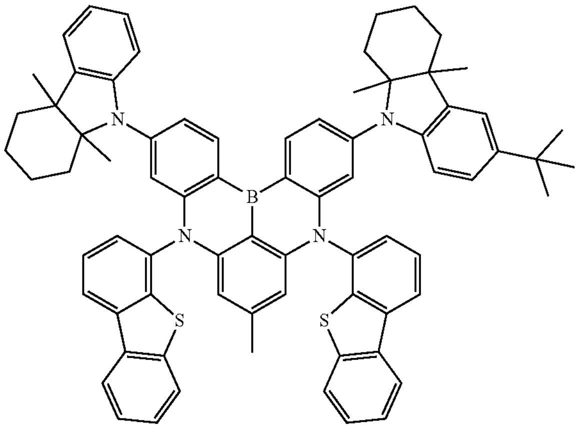
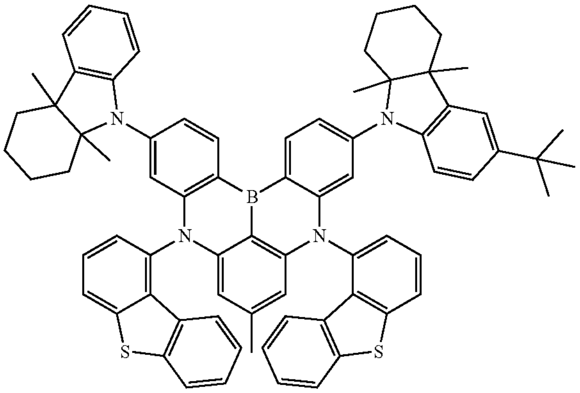
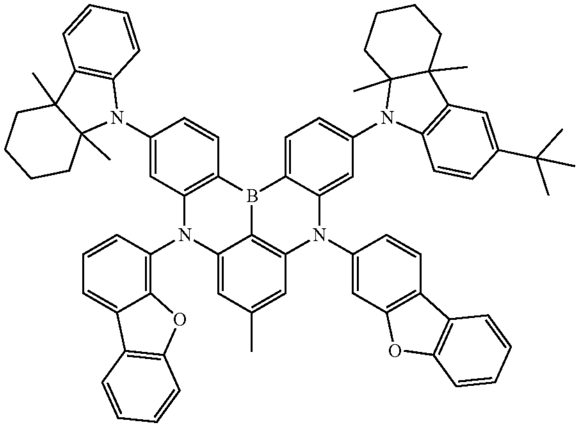
-continued
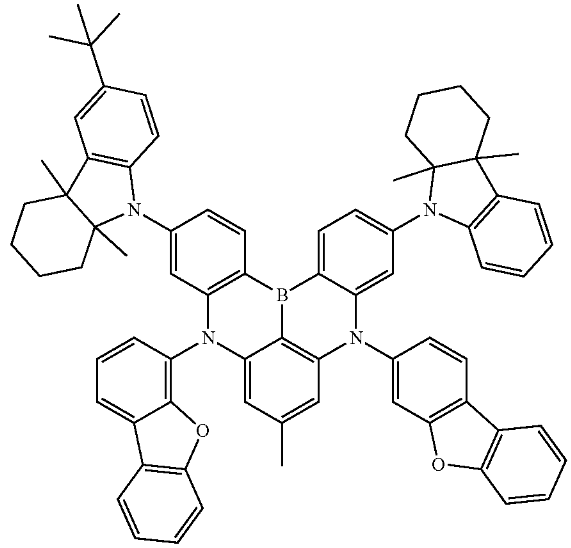
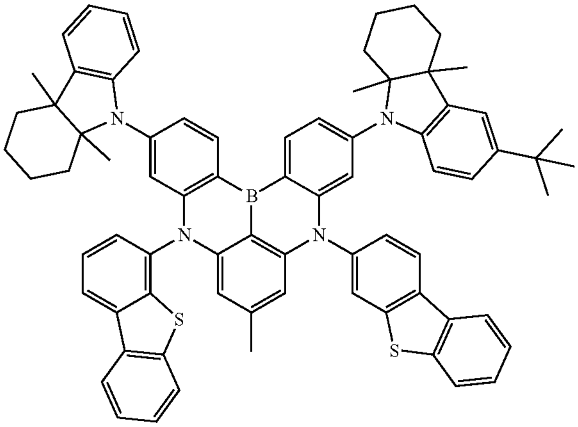
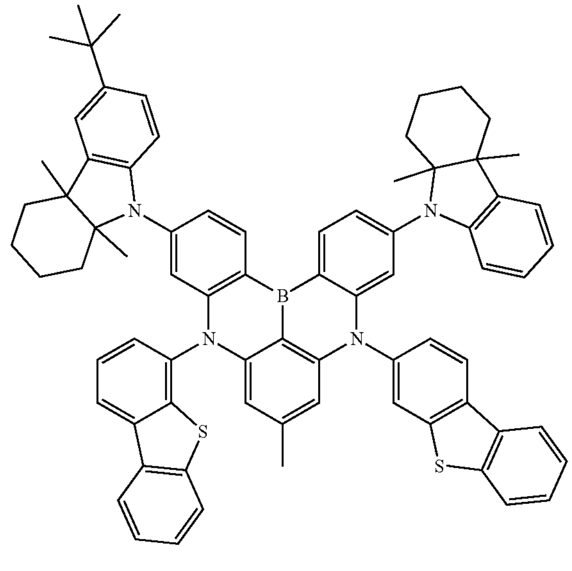

-continued
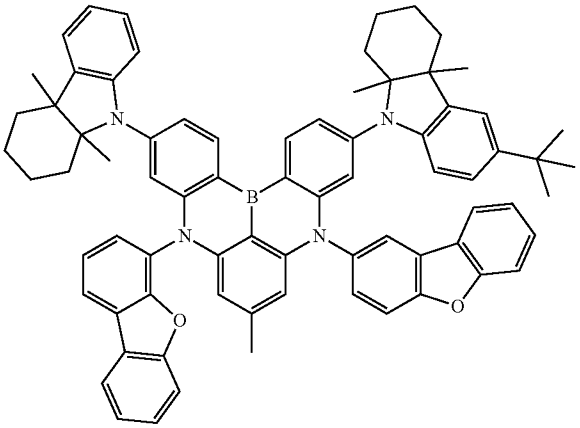
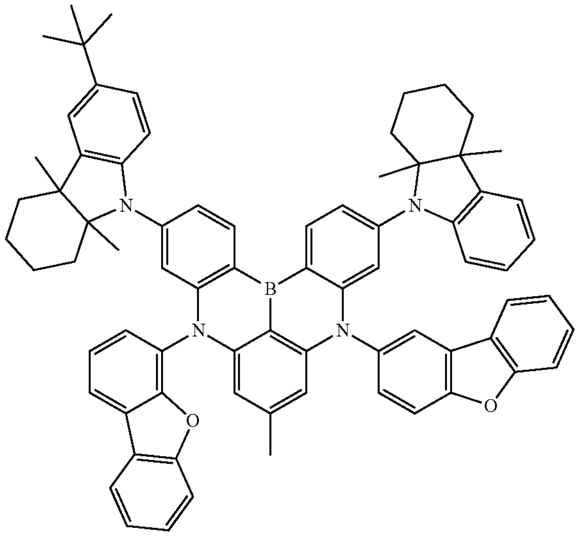
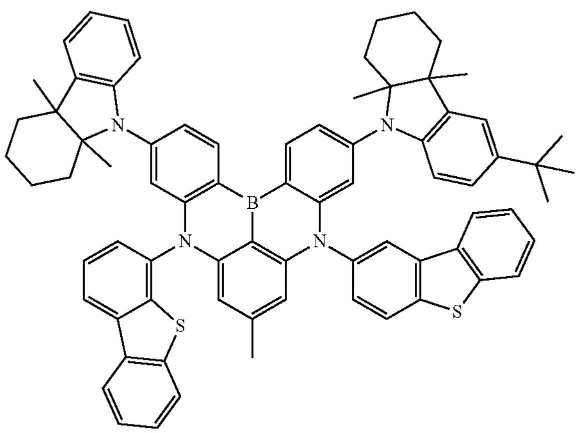
-continued
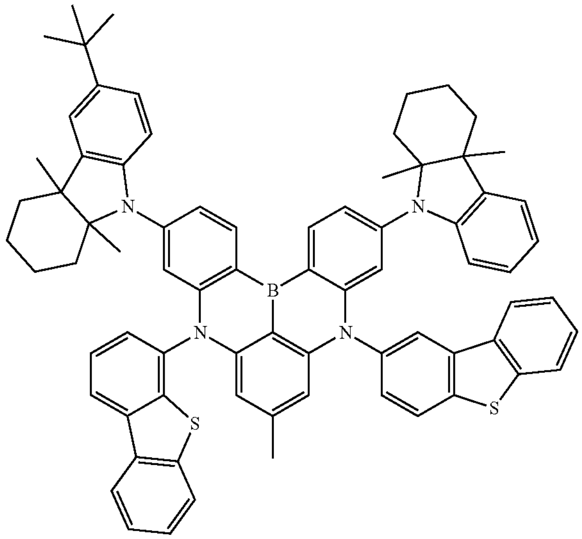 [SMILES: Cc1cc2c3c(c1)N(c1cccc4c1sc1ccccc14)c1cc(N4c5ccc(C(C)(C)C)cc5C5(C)CCCCC45C)ccc1B3c1ccc(N3c4ccccc4C4(C)CCCCC34C)cc1N2c1ccc2sc3ccccc3c2c1]
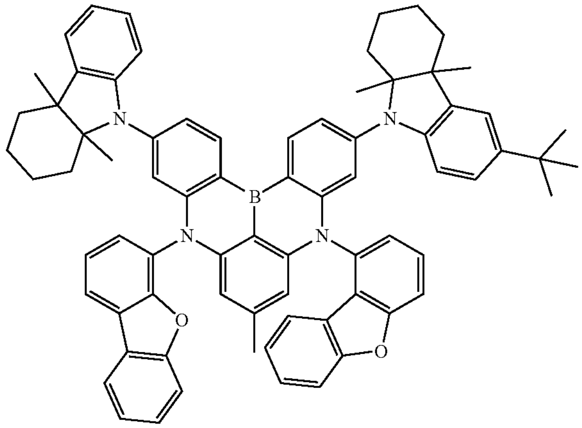
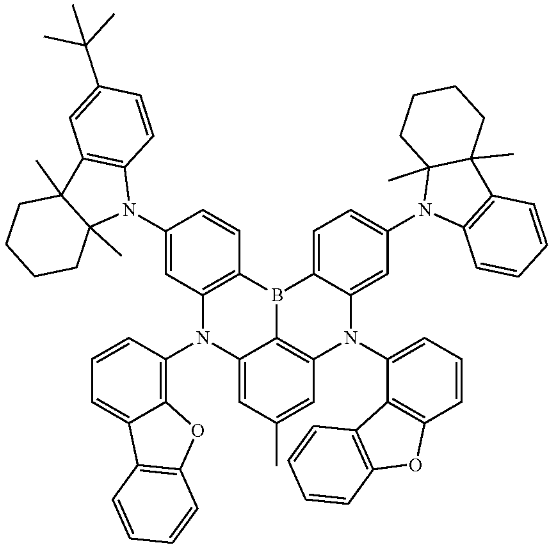

-continued
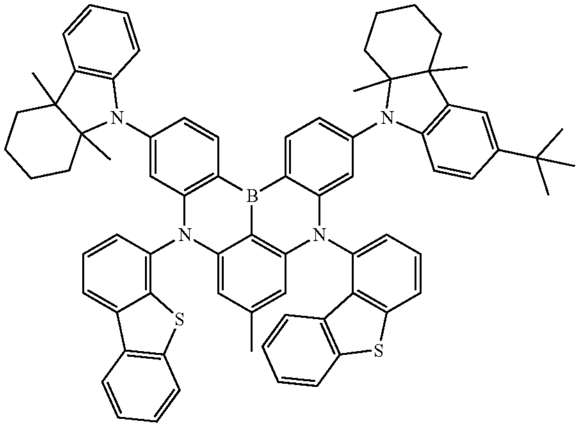
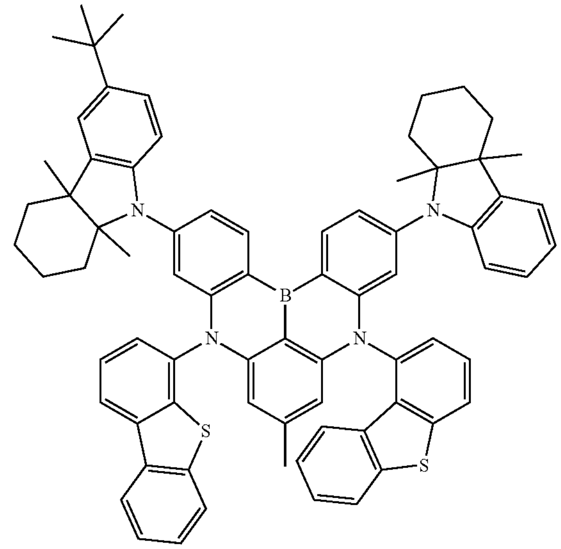 [SMILES: Cc1cc2c3c(c1)N(c1cccc4sc5ccccc5c14)c1cc(N4c5ccccc5C5(C)CCCCC45C)ccc1B3c1ccc(N3c4ccc(C(C)(C)C)cc4C4(C)CCCCC34C)cc1N2c1cccc2c1sc1ccccc12]
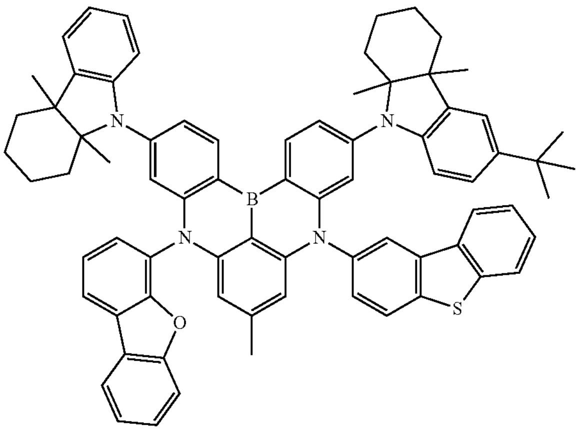
-continued
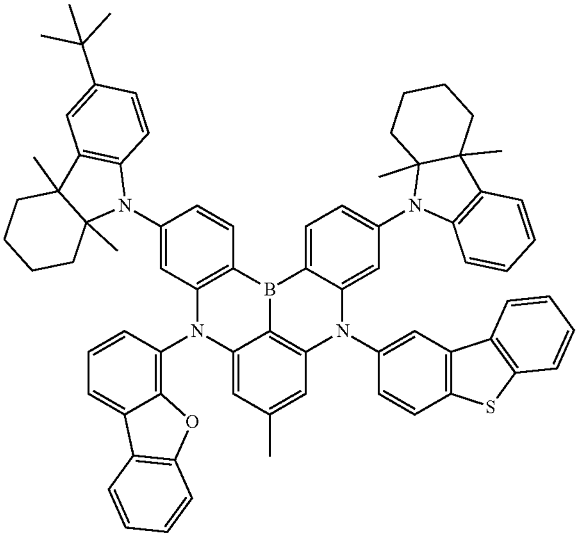
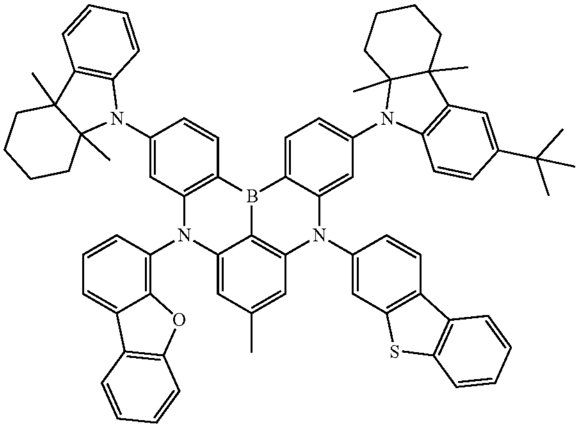
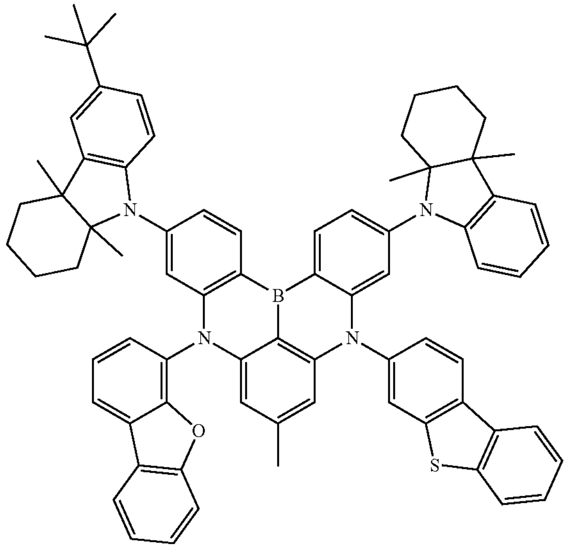 [SMILES: Cc1cc2c3c(c1)N(c1cccc4c1oc1ccccc14)c1cc(N4c5ccc(C(C)(C)C)cc5C5(C)CCCCC45C)ccc1B3c1ccc(N3c4ccccc4C4(C)CCCCC34C)cc1N2c1ccc2c(c1)sc1ccccc12]

-continued
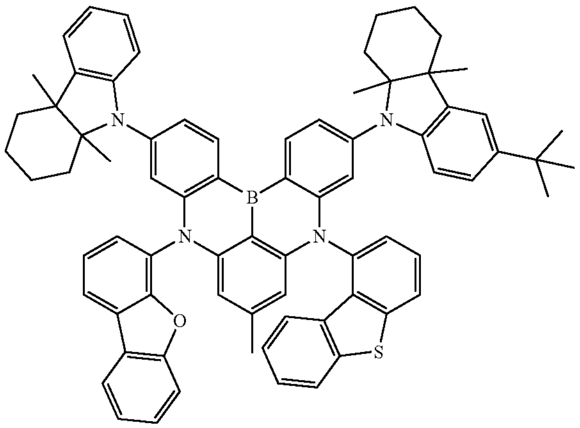
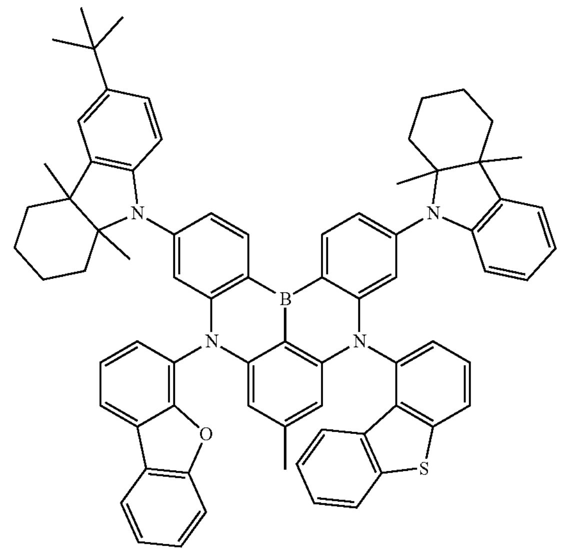
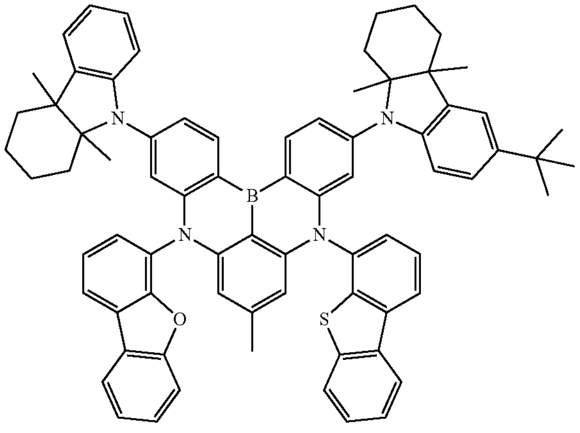
-continued
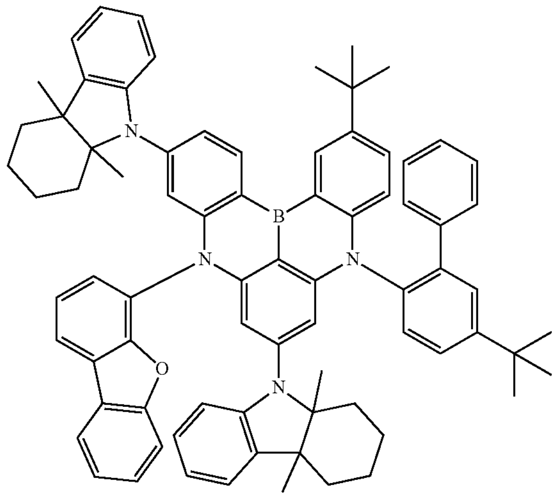
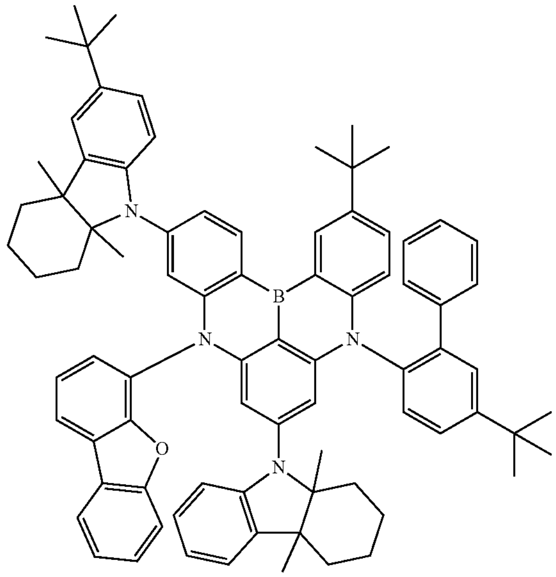
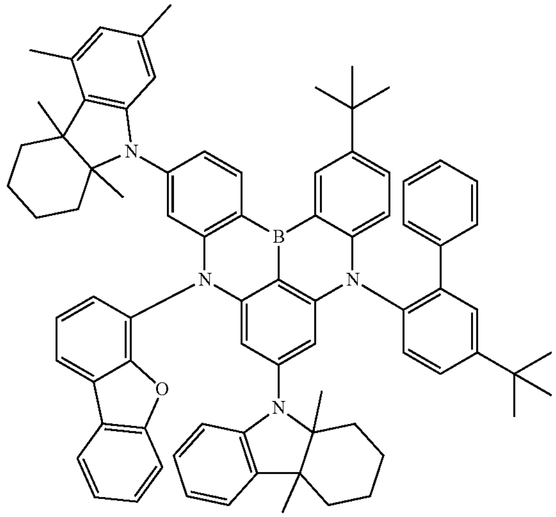

-continued
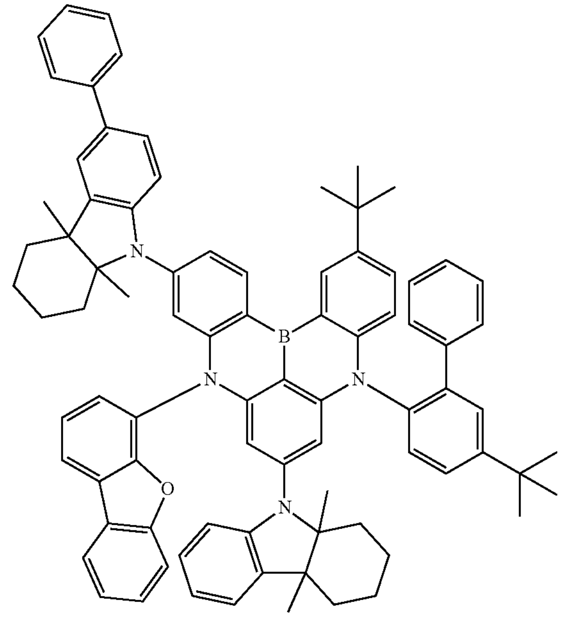 [SMILES: CC(C)(C)c1ccc2c(c1)B1c3ccc(N4c5ccc(-c6ccccc6)cc5C5(C)CCCCC45C)cc3N(c3cccc4c3oc3ccccc34)c3cc(N4c5ccccc5C5(C)CCCCC45C)cc(c31)N2c1ccc(C(C)(C)C)cc1-c1ccccc1]
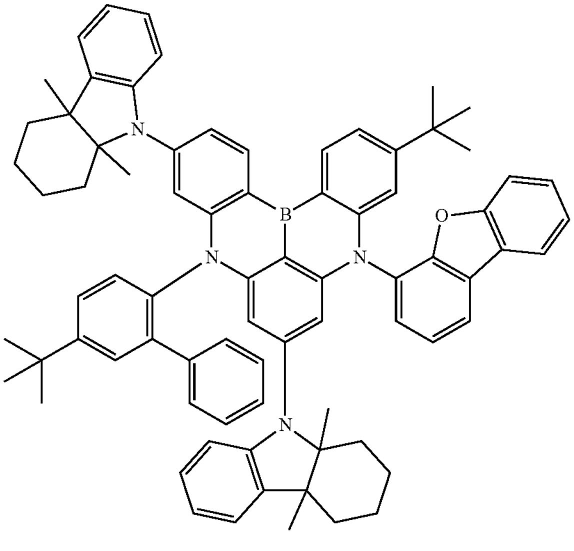
-continued
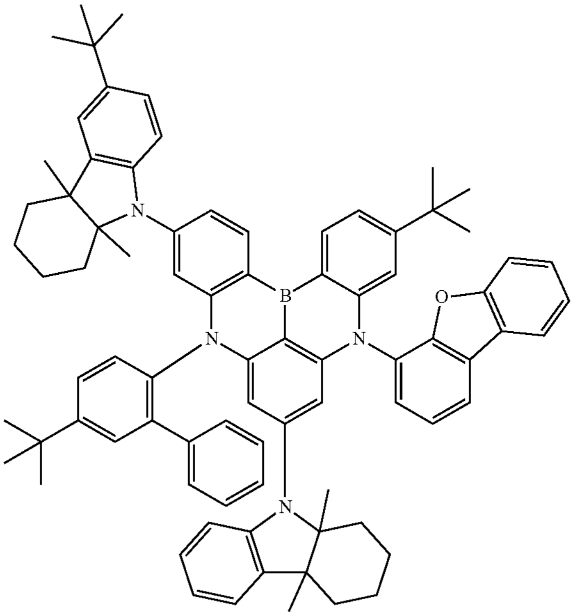
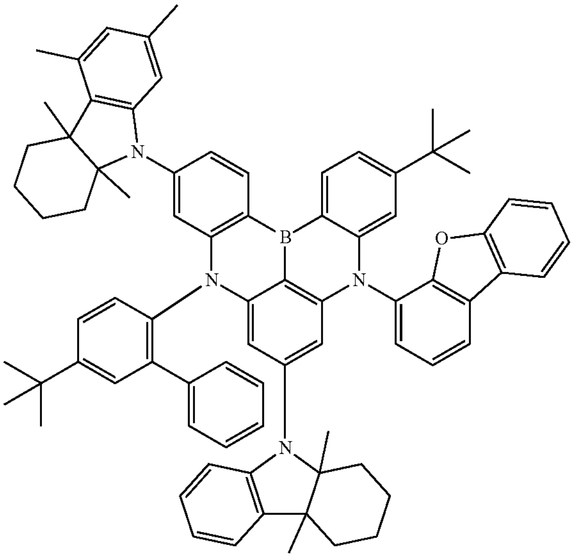

-continued
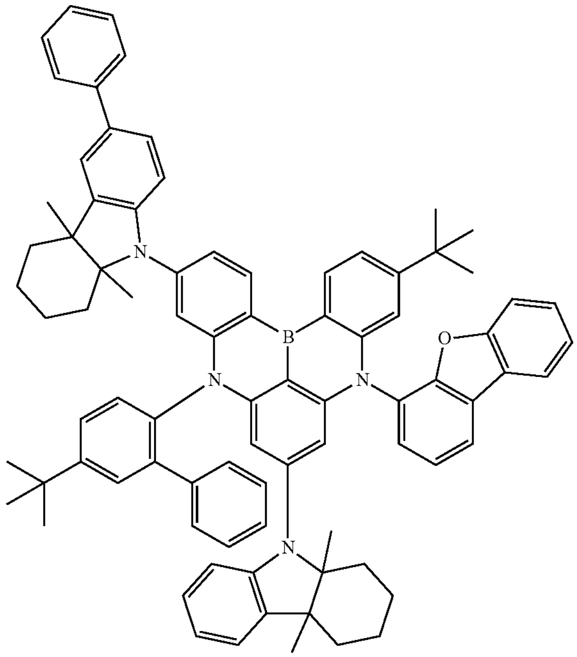 [SMILES: CC(C)(C)c1ccc(N2c3cc(N4c5ccc(-c6ccccc6)cc5C5(C)CCCCC45C)ccc3B3c4ccc(C(C)(C)C)cc4N(c4cccc5c4oc4ccccc45)c4cc(N5c6ccccc6C6(C)CCCCC56C)cc2c43)c(-c2ccccc2)c1]
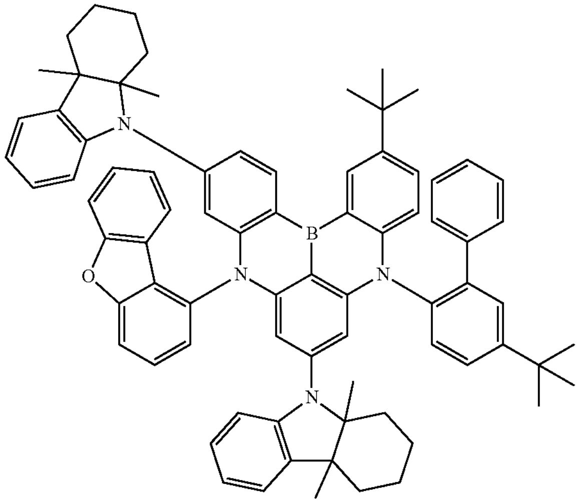
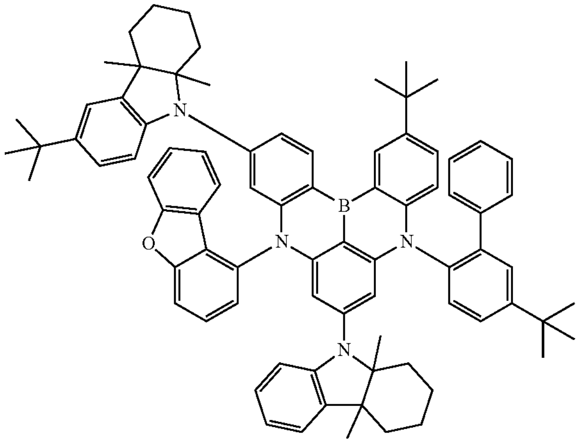
-continued
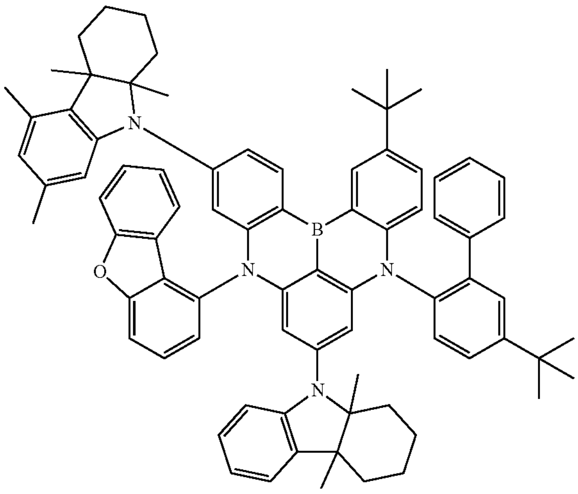
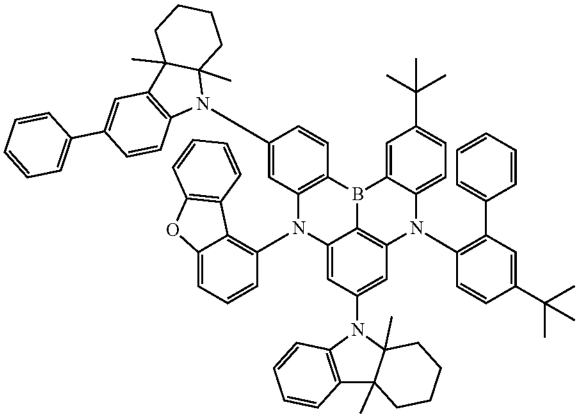 [SMILES: CC(C)(C)c1ccc2c(c1)B1c3ccc(N4c5ccc(-c6ccccc6)cc5C5(C)CCCCC45C)cc3N(c3cccc4oc5ccccc5c34)c3cc(N4c5ccccc5C5(C)CCCCC45C)cc(c31)N2c1ccc(C(C)(C)C)cc1-c1ccccc1]
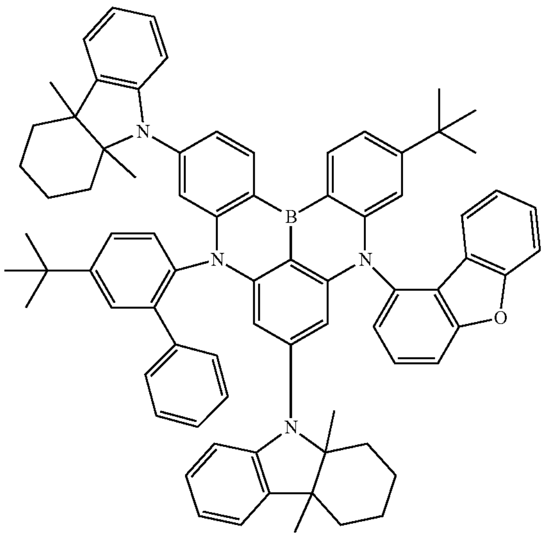

-continued
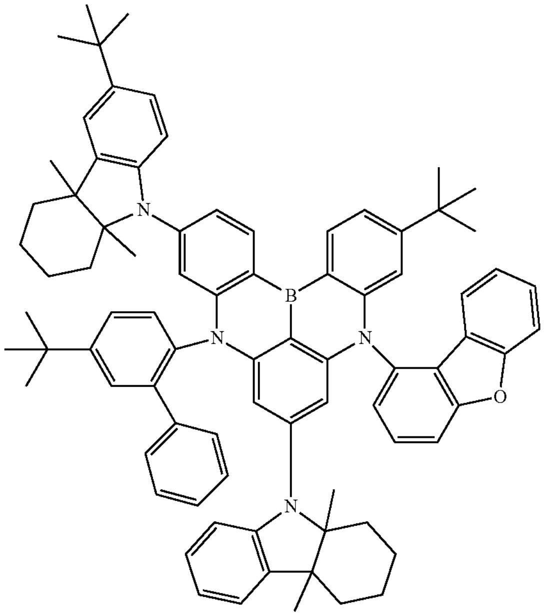
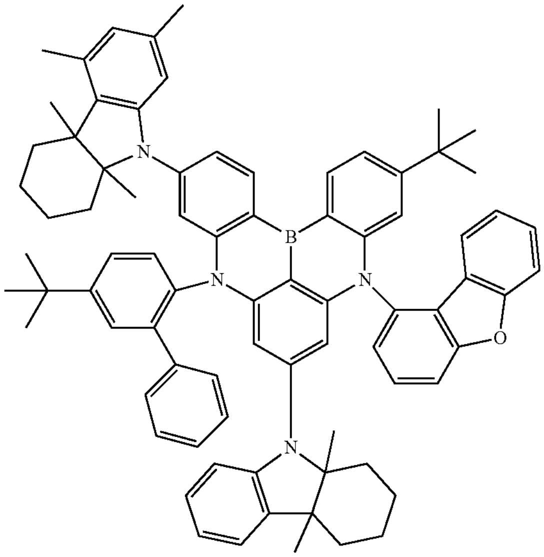
-continued
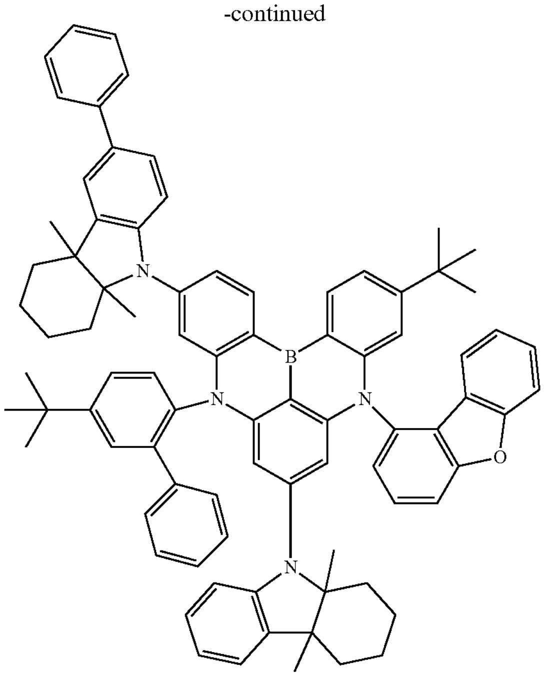
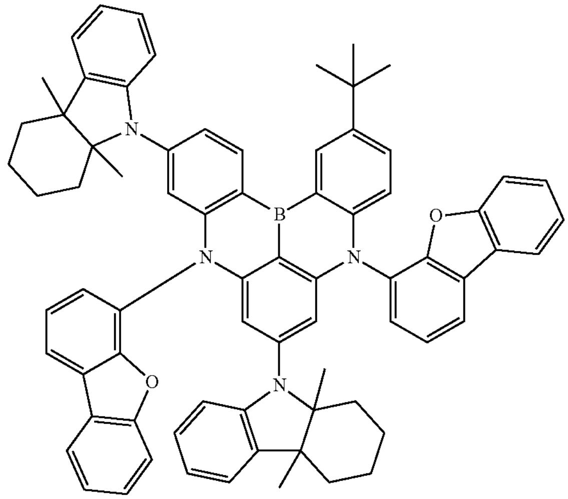
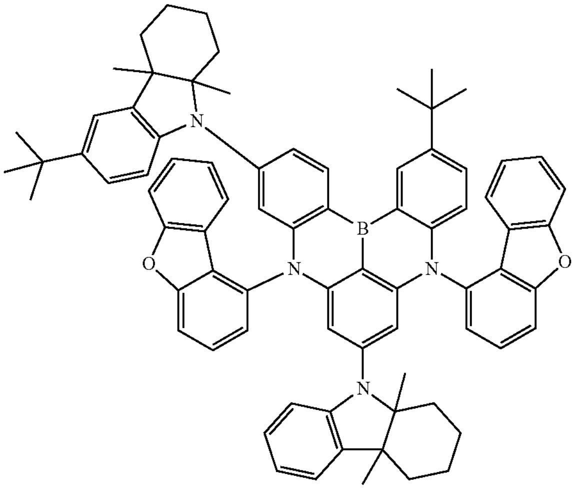

-continued
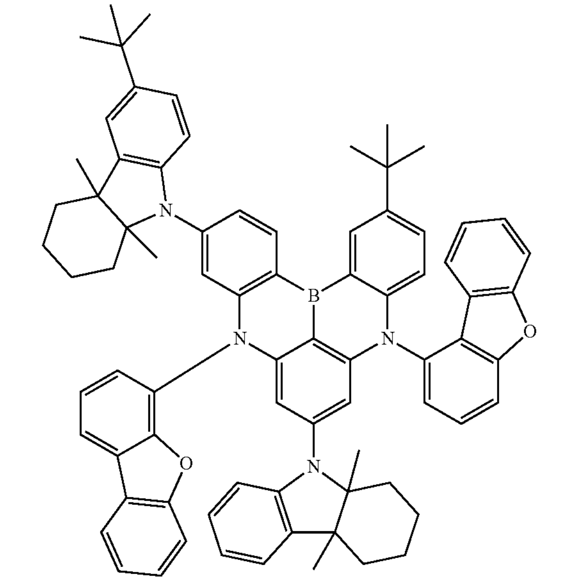
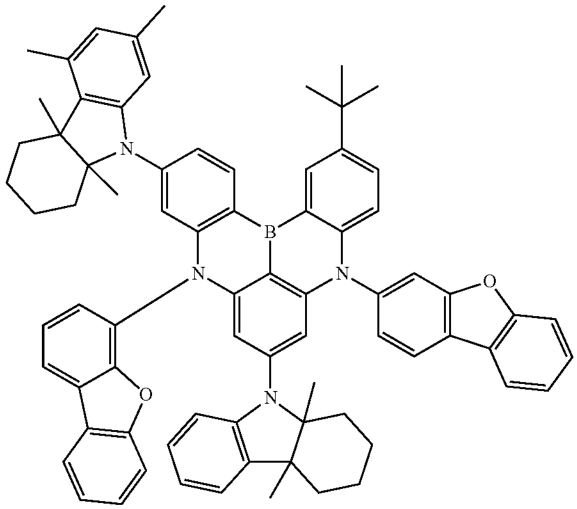
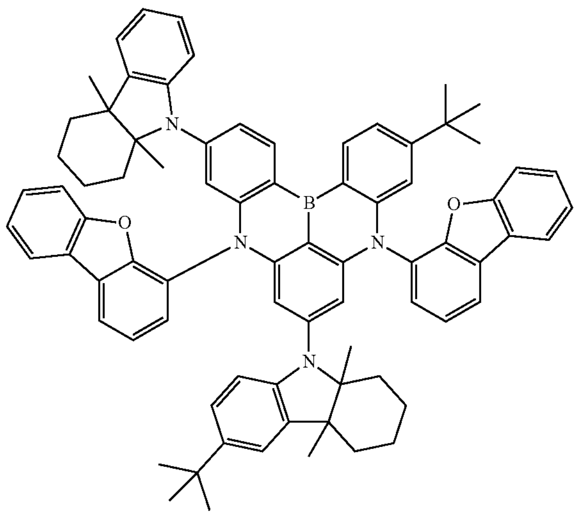
-continued
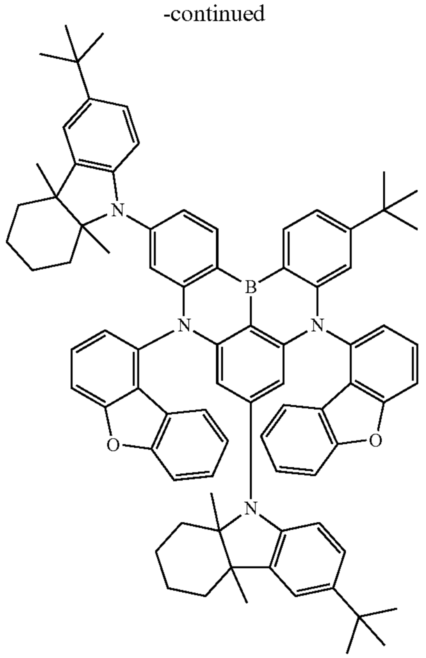
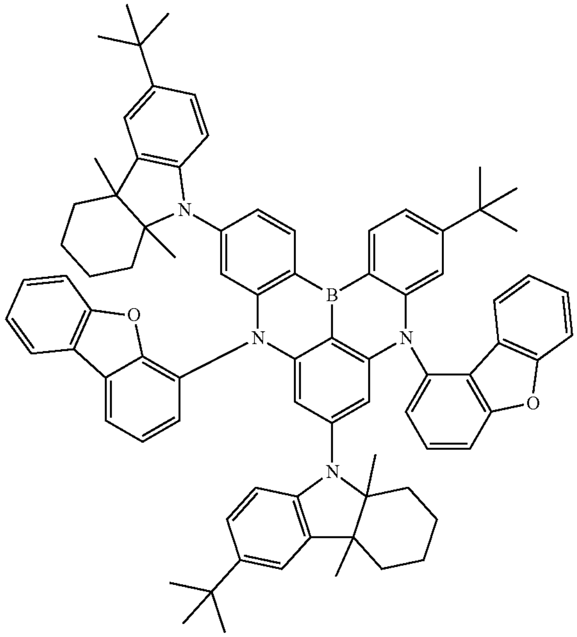

-continued
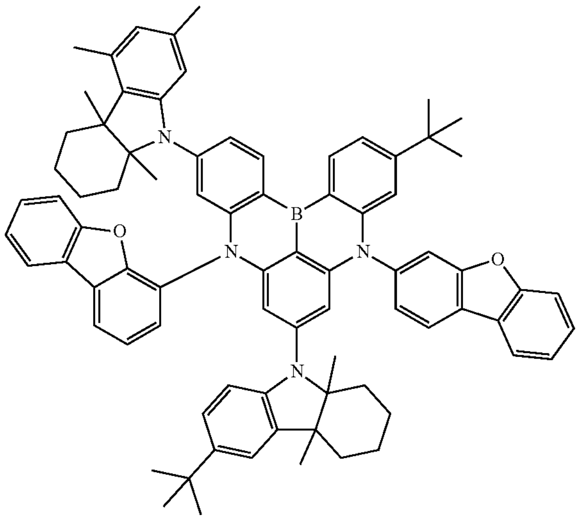
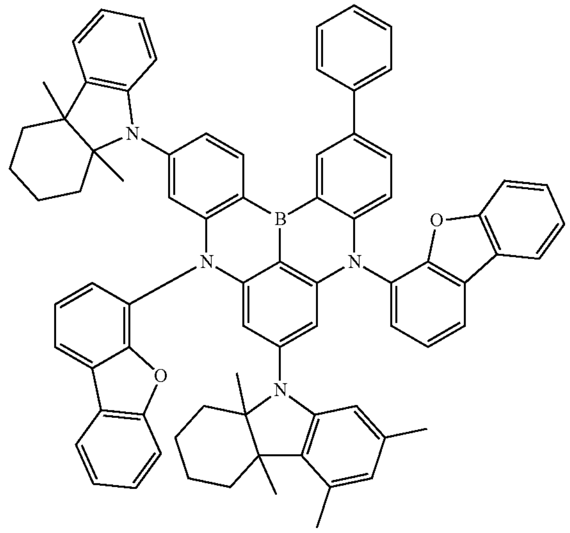
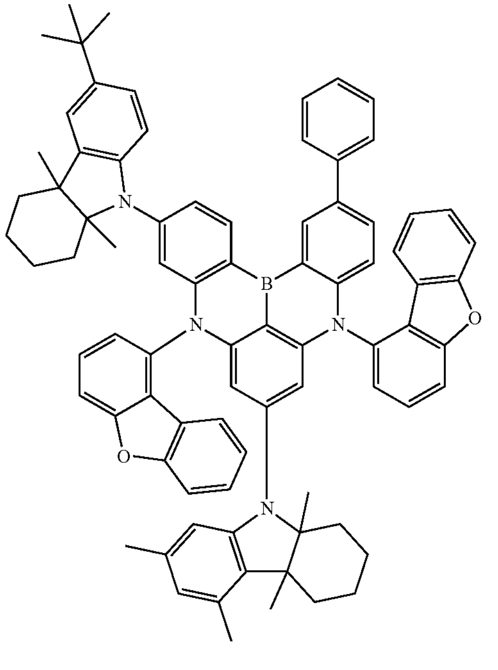
-continued
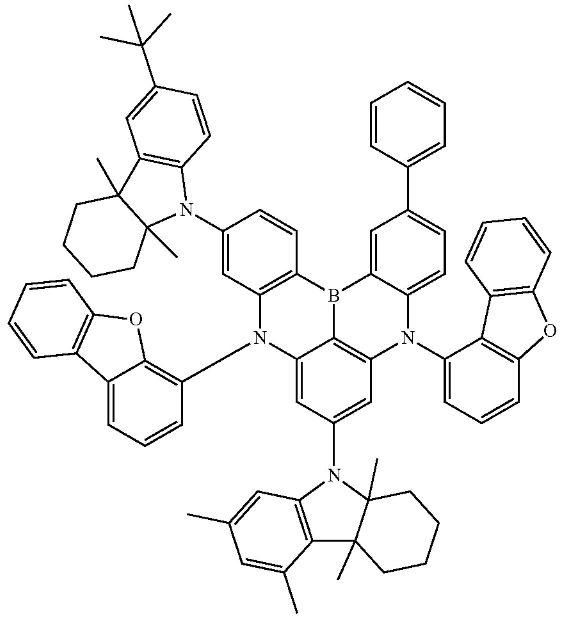
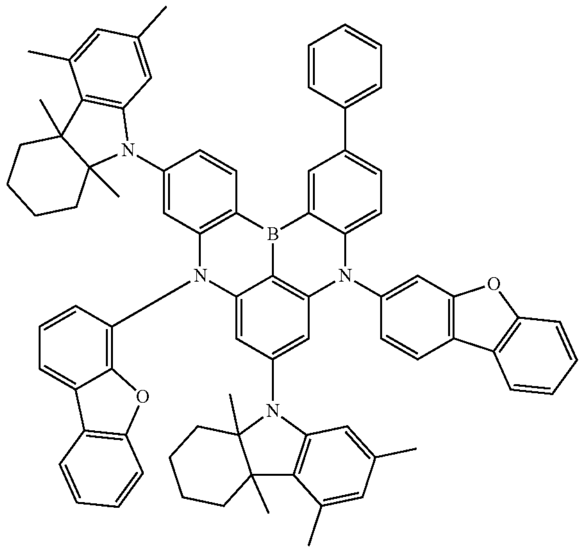
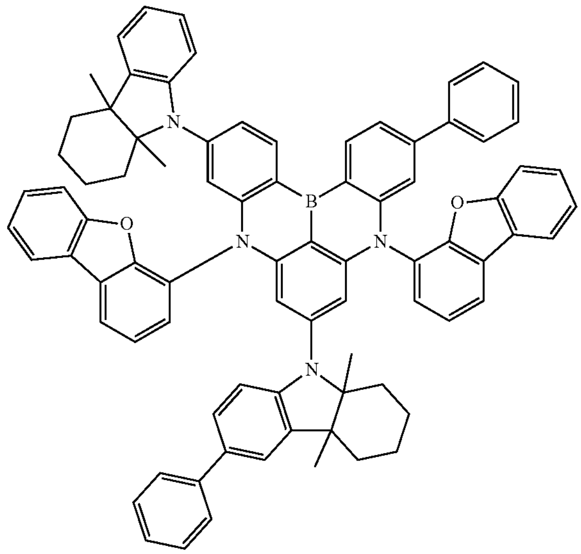

-continued
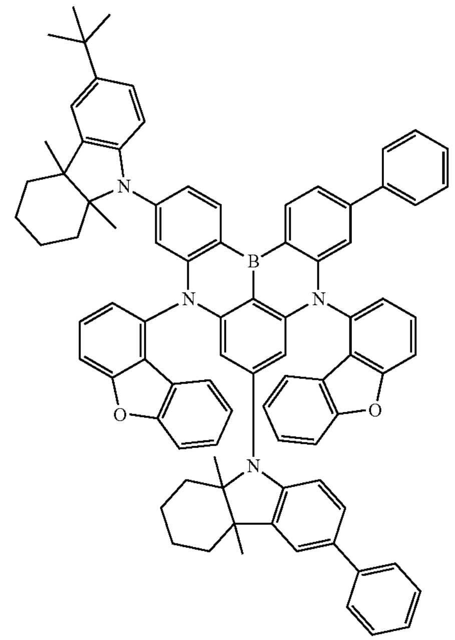
-continued
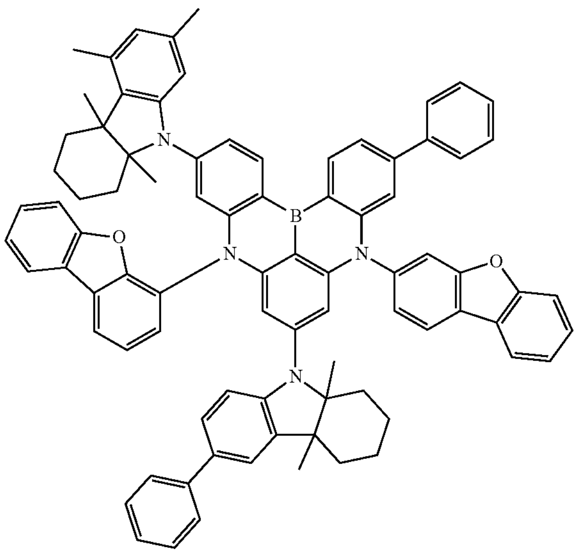
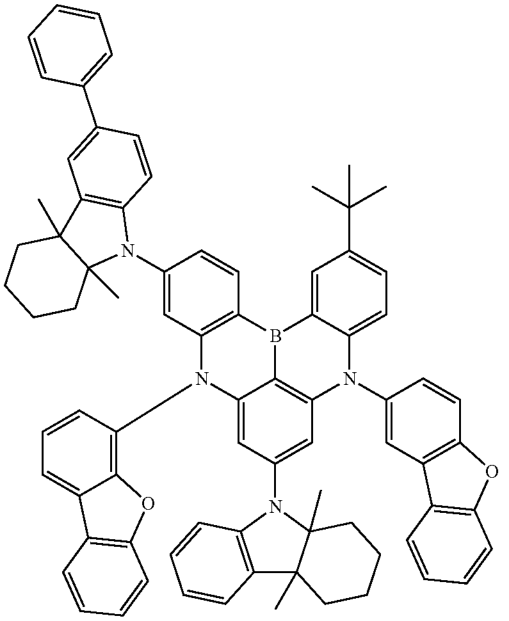
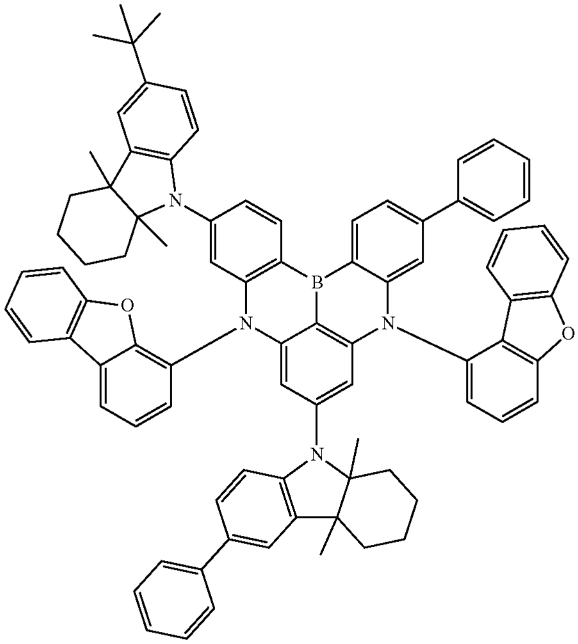
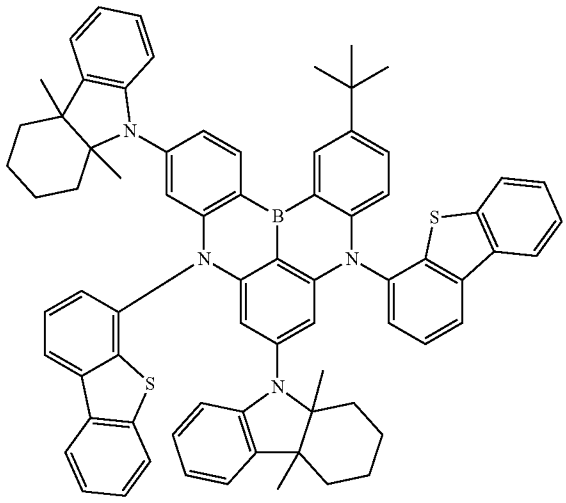

-continued
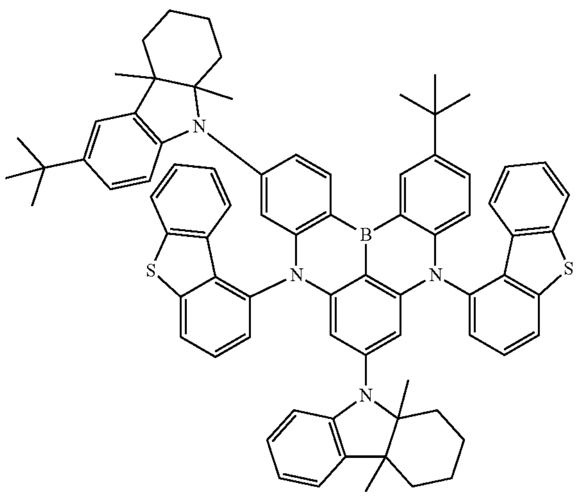
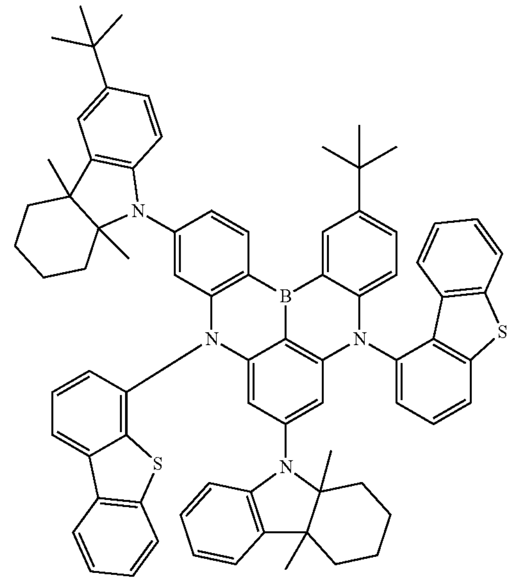
-continued
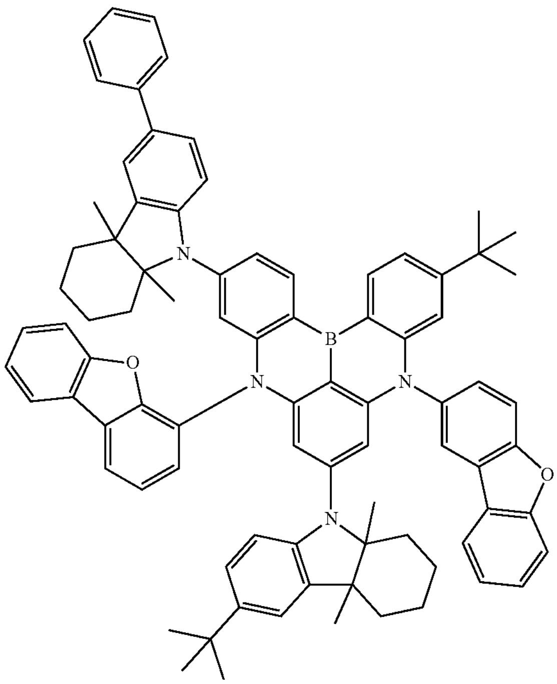
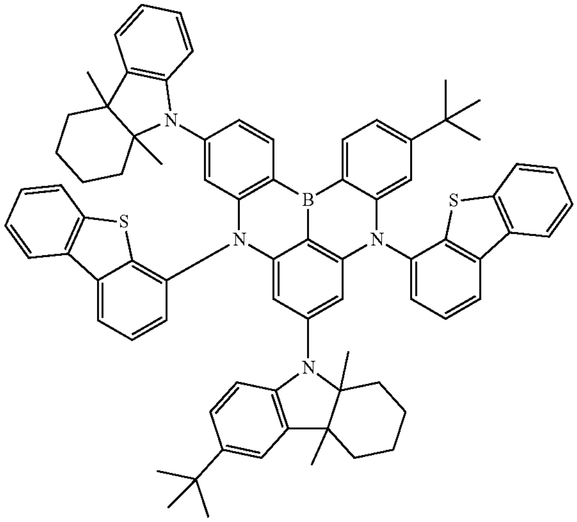

-continued
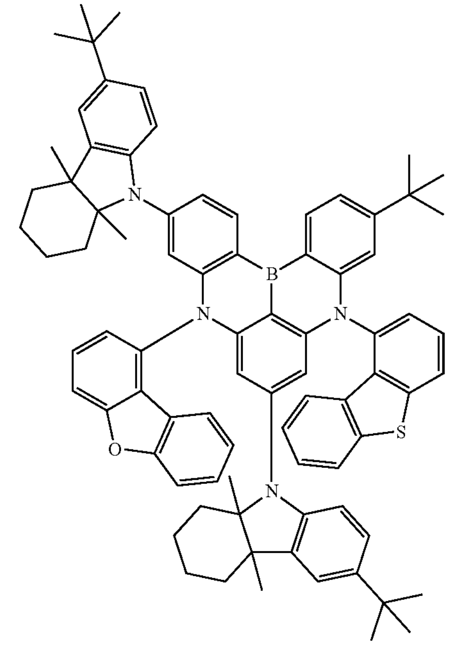
-continued
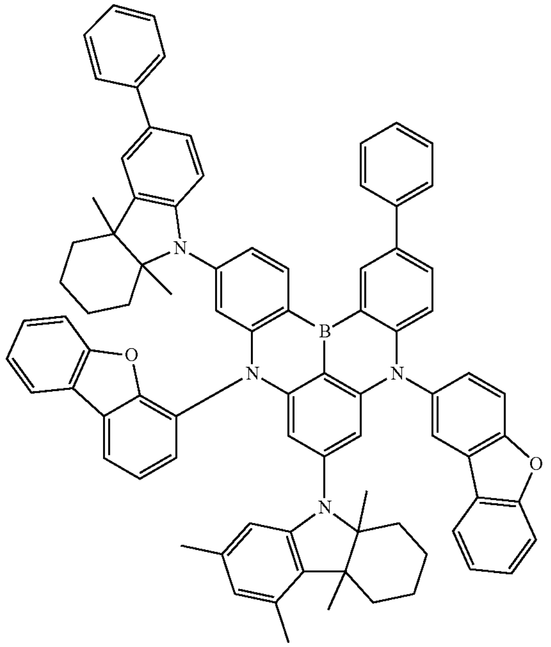
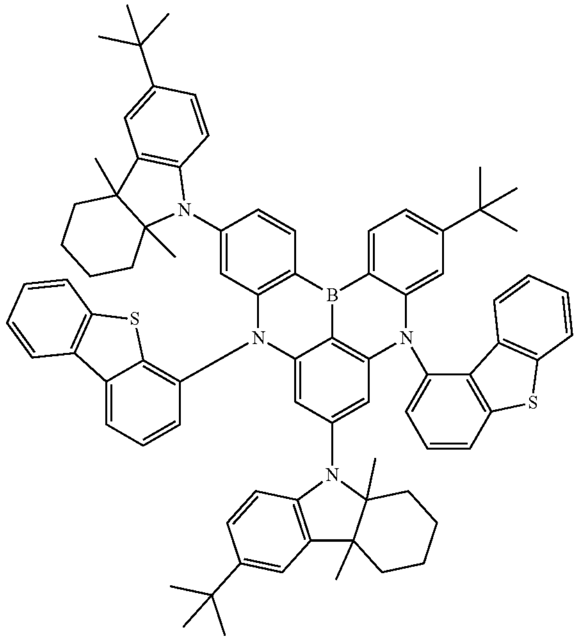
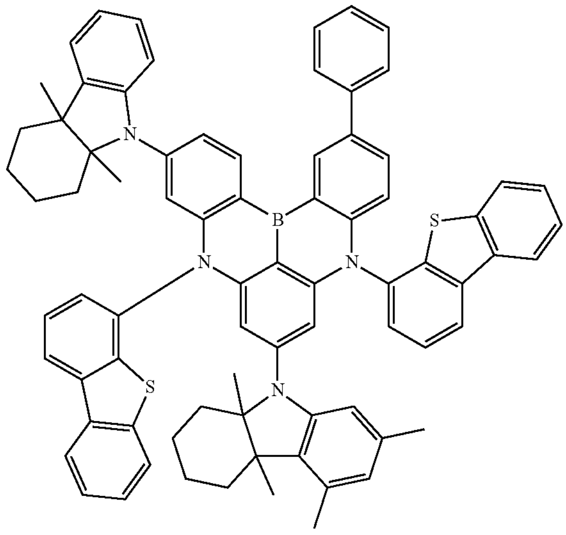

-continued
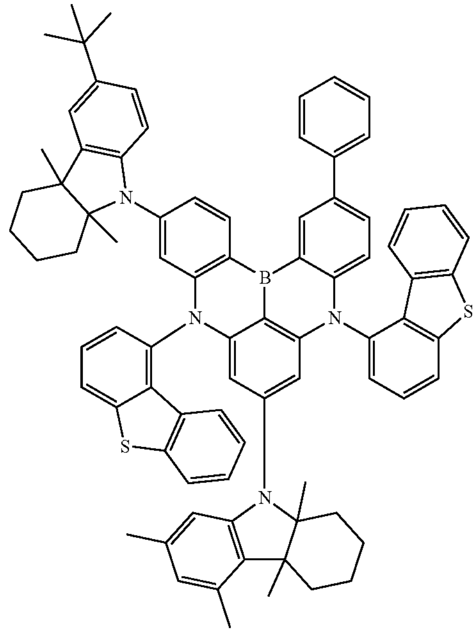
-continued
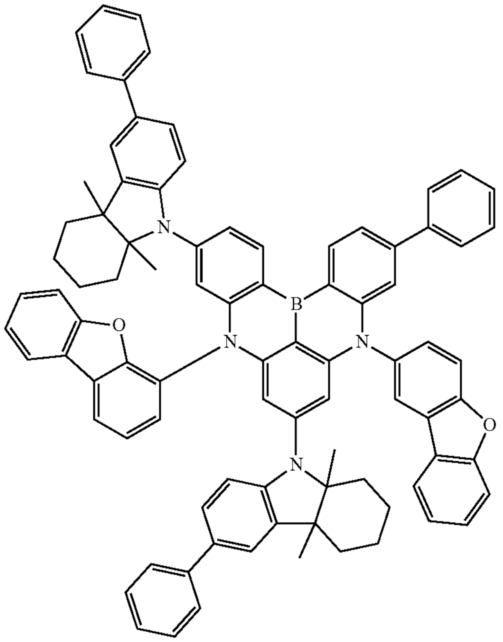
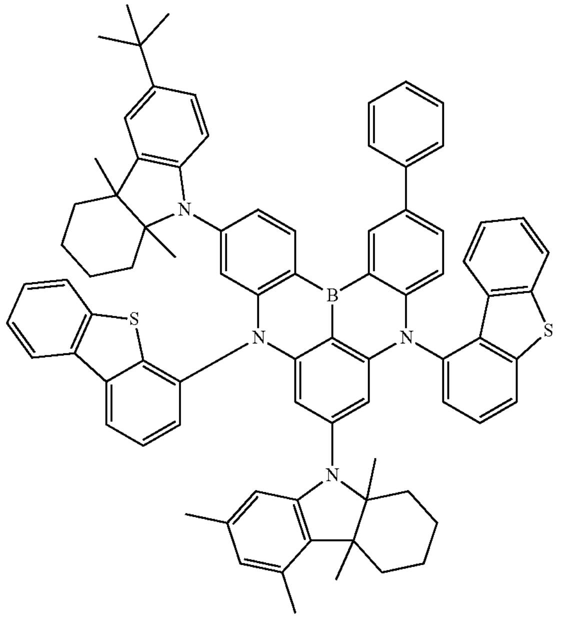
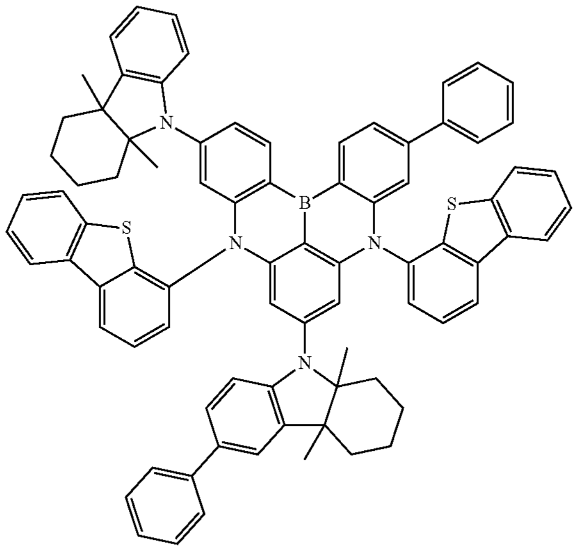

-continued
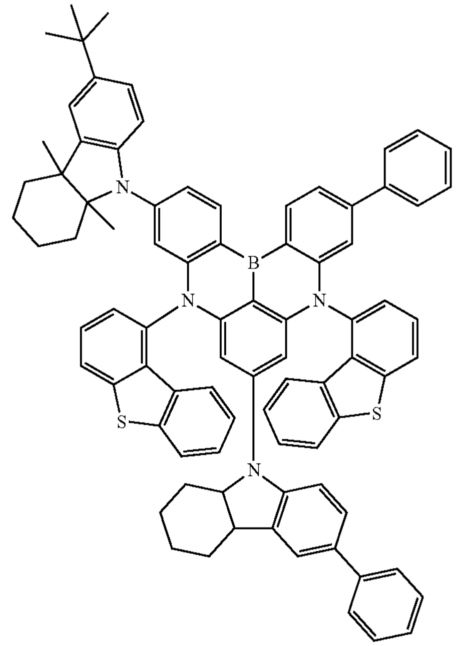
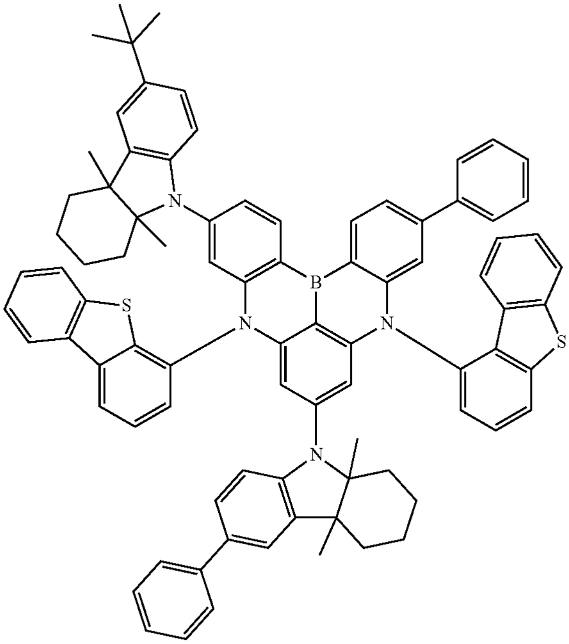
-continued
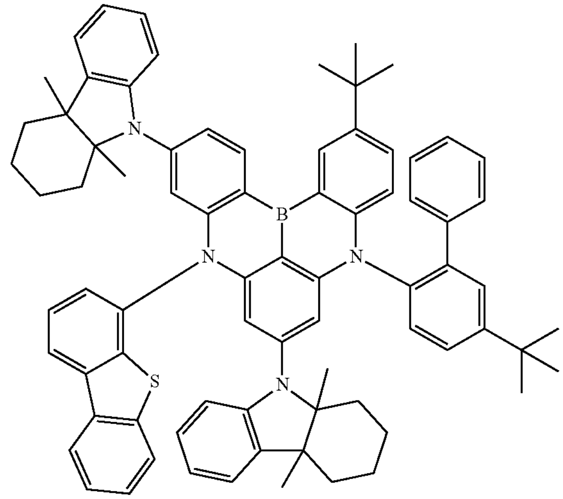
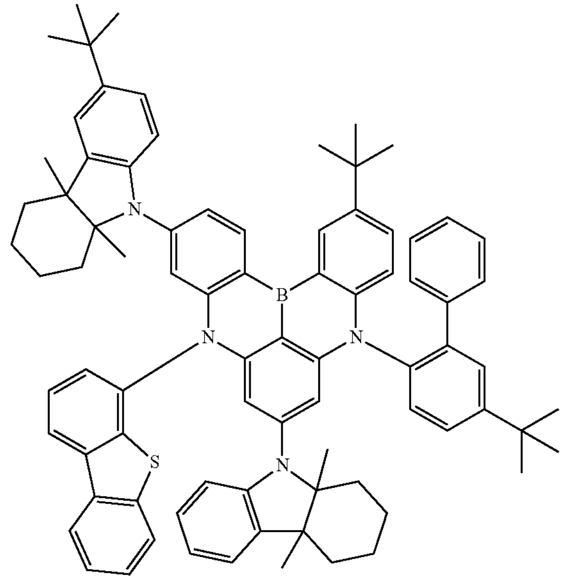
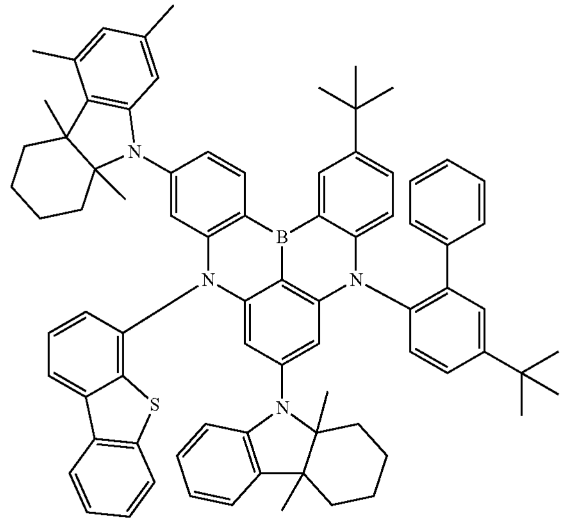

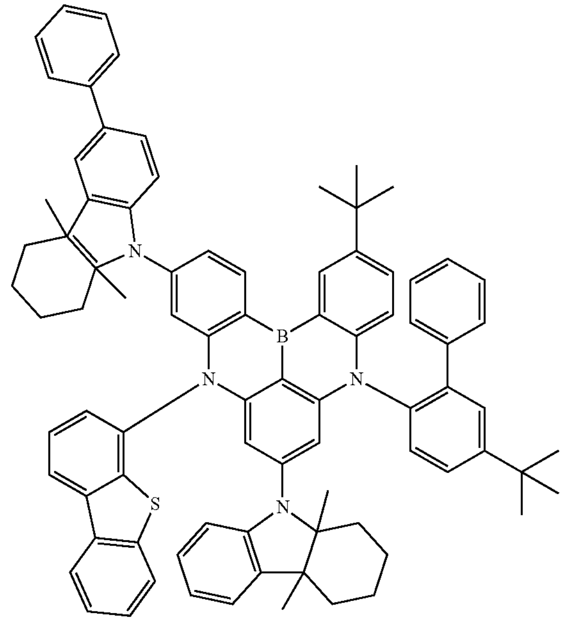
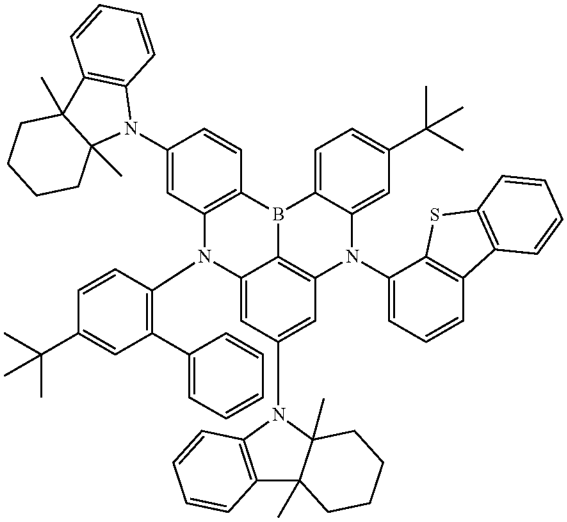
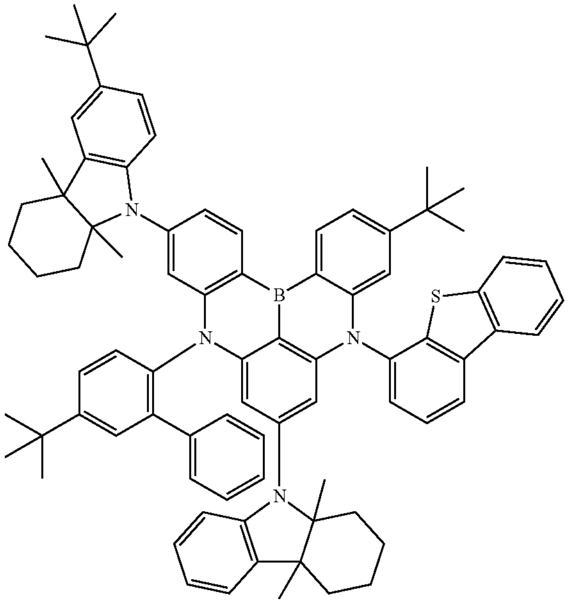
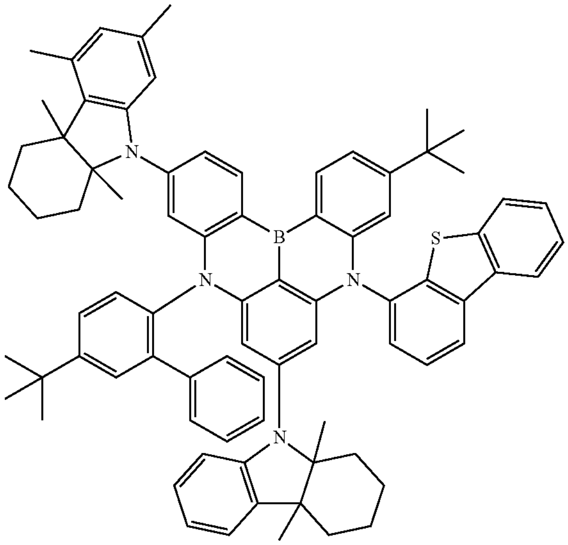

-continued
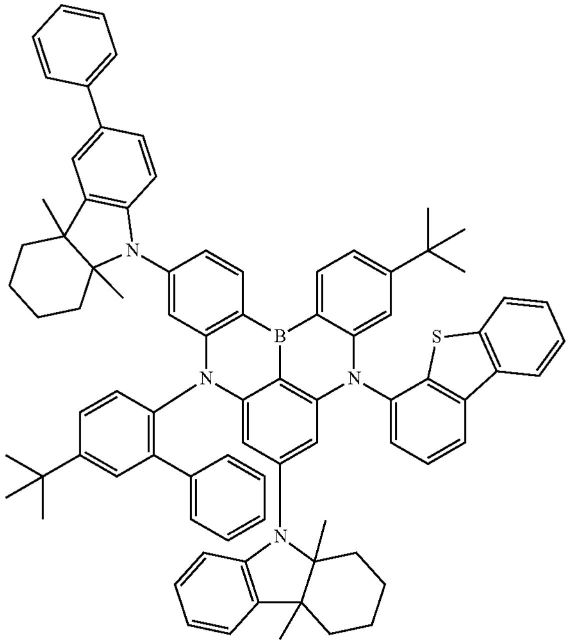
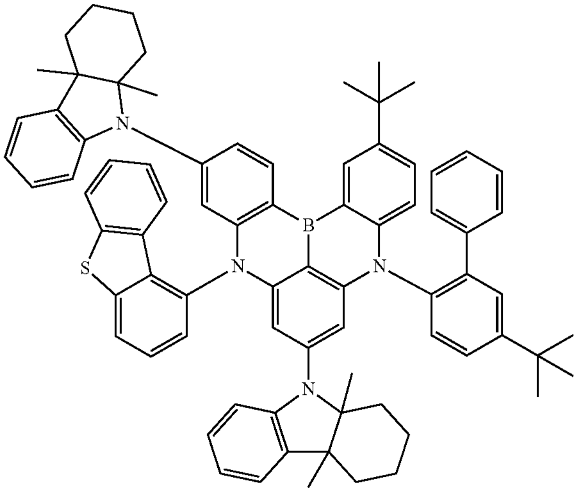
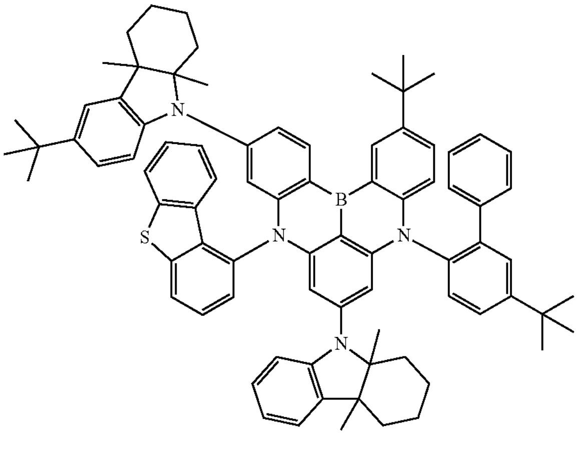
-continued
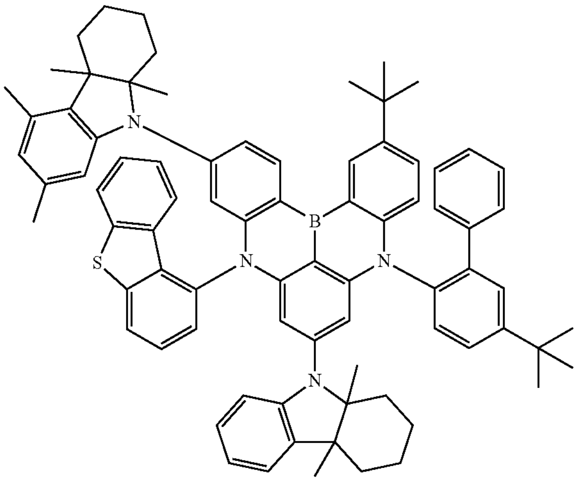
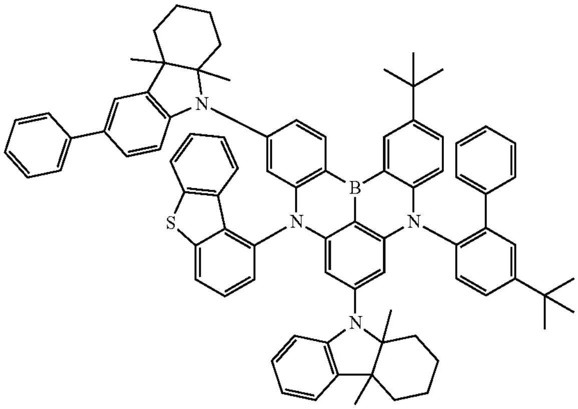
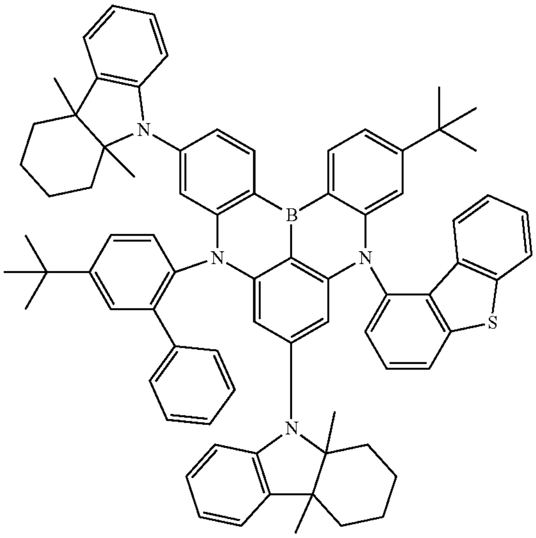

-continued
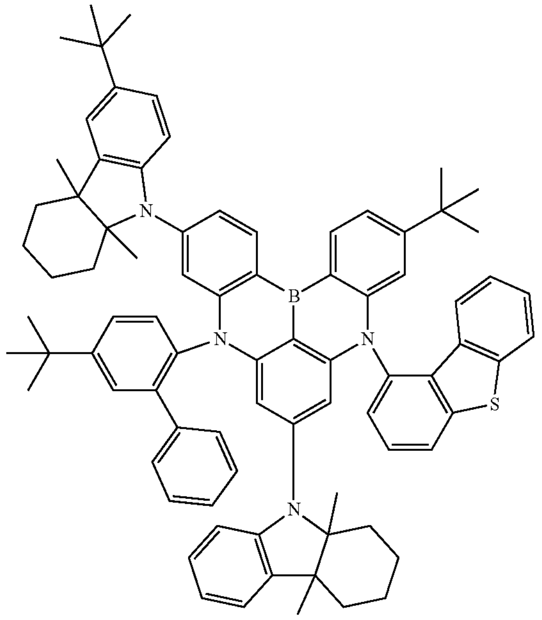
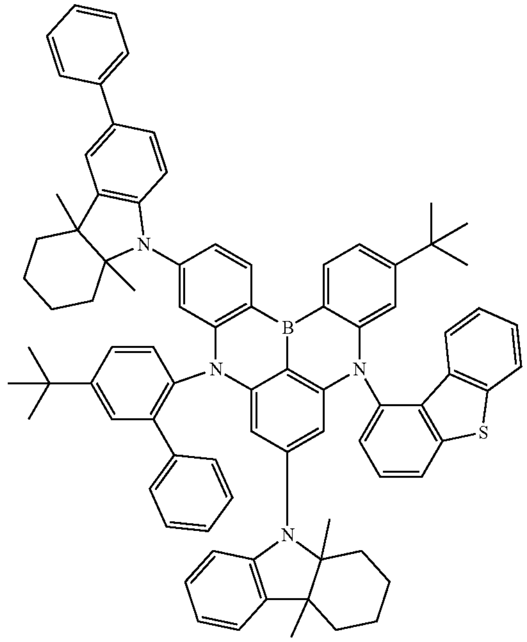
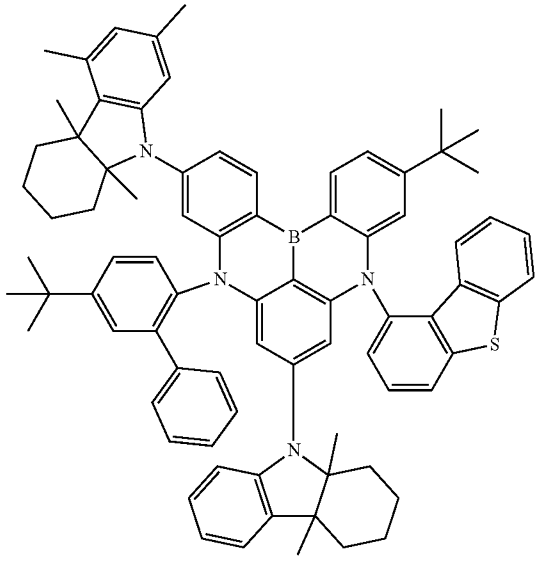
-continued
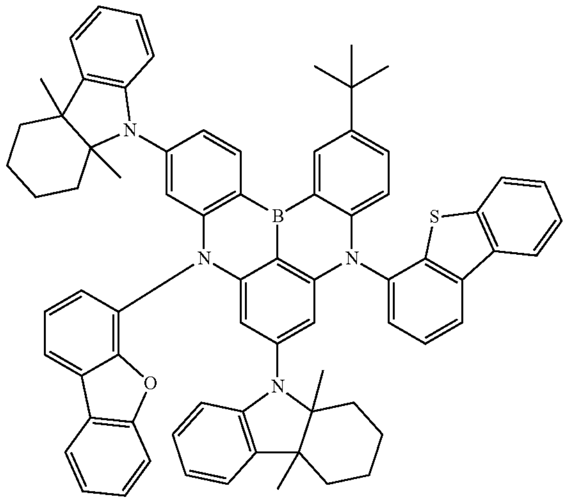
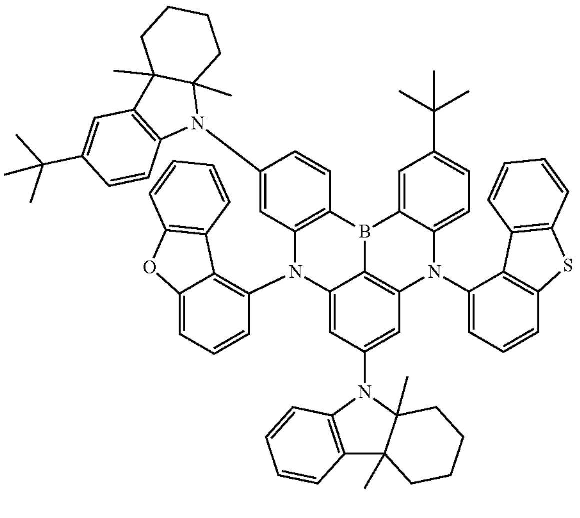

-continued
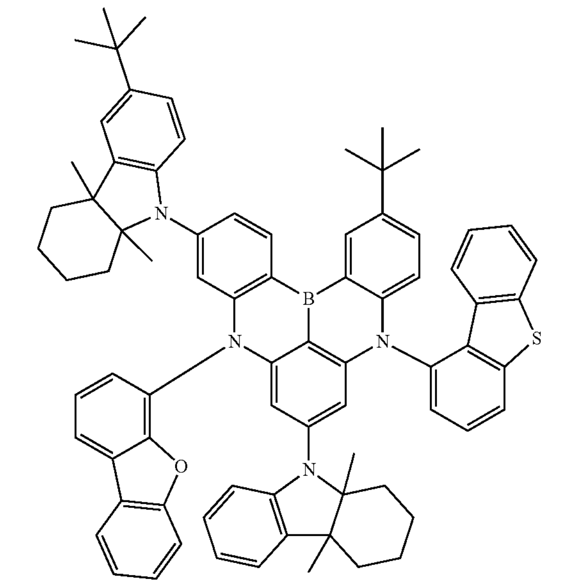
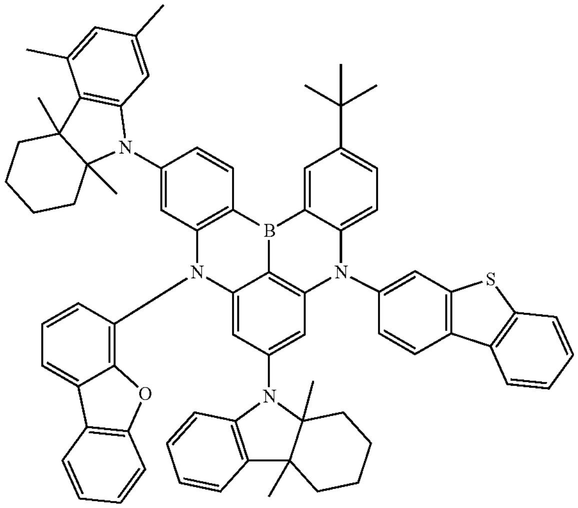
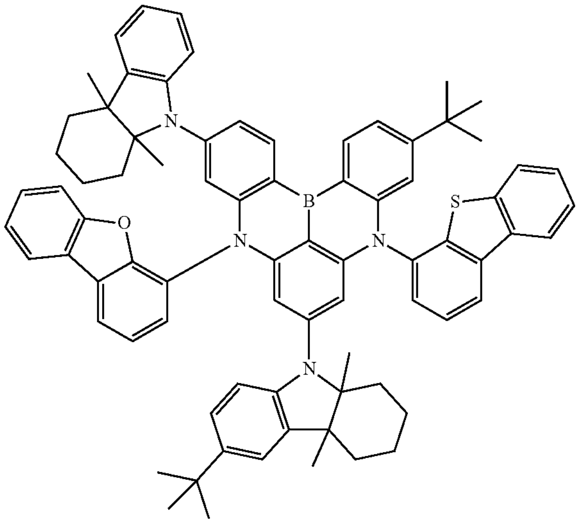
-continued
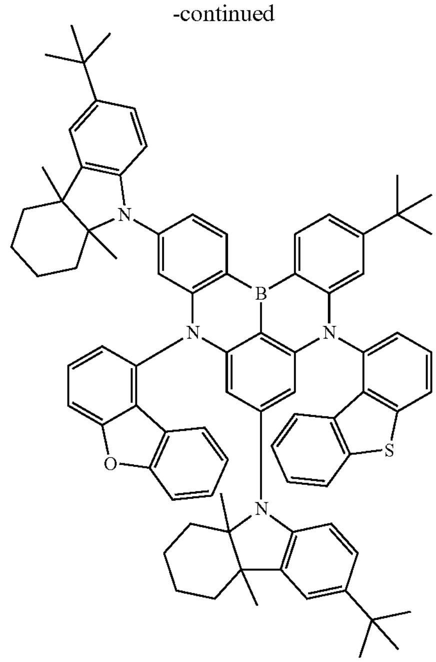
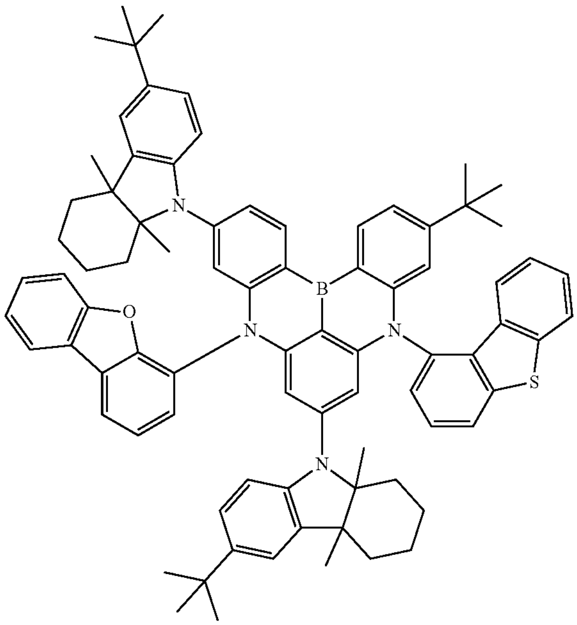

-continued
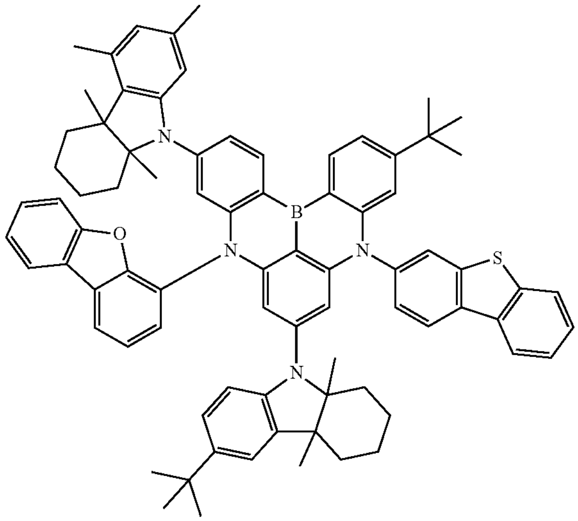
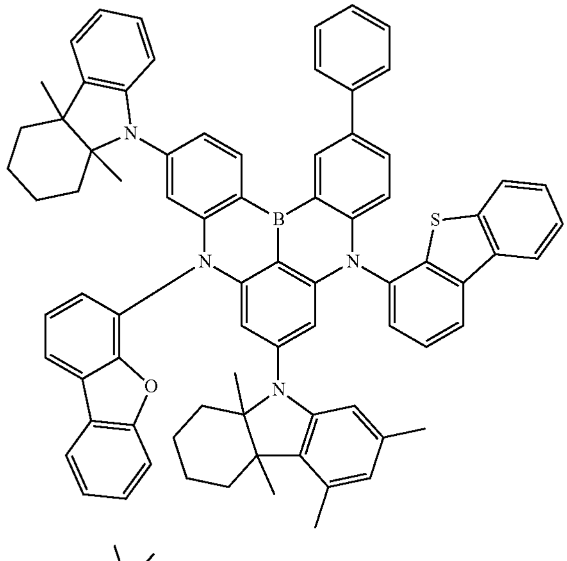
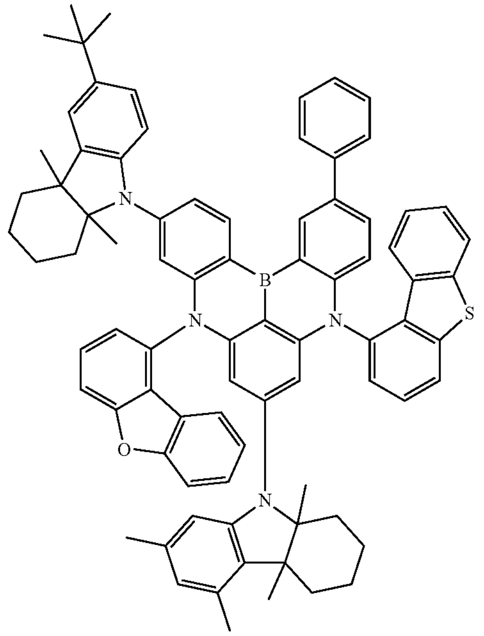
-continued
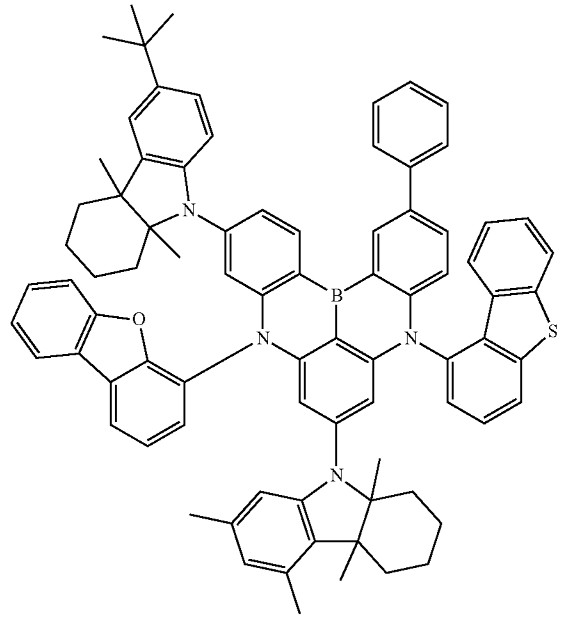
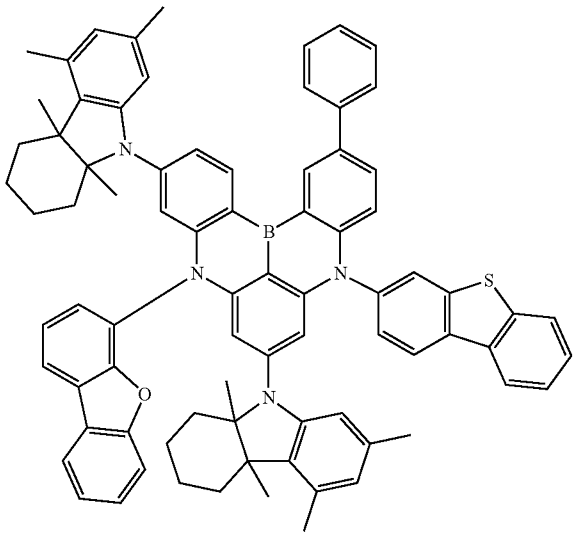
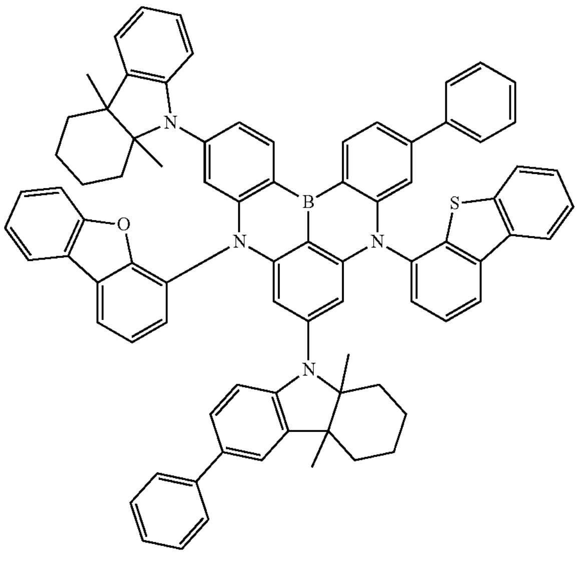

-continued
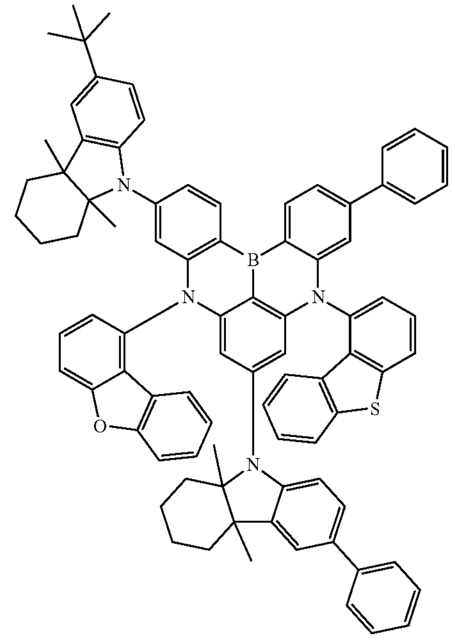
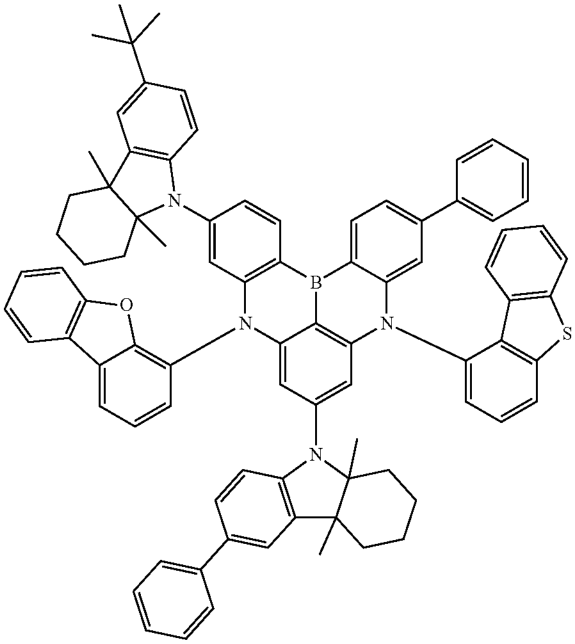
-continued
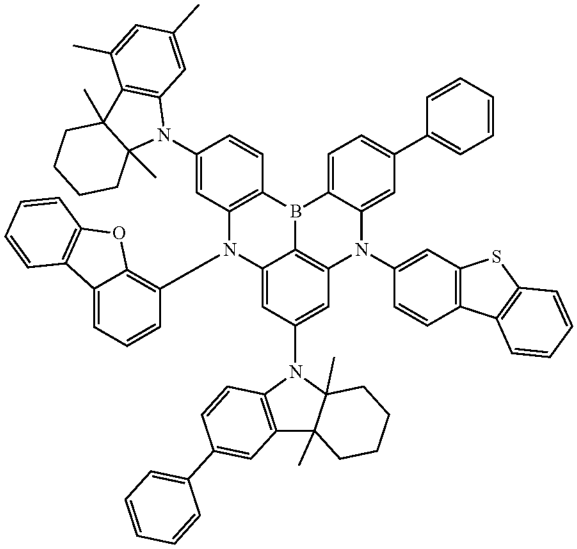
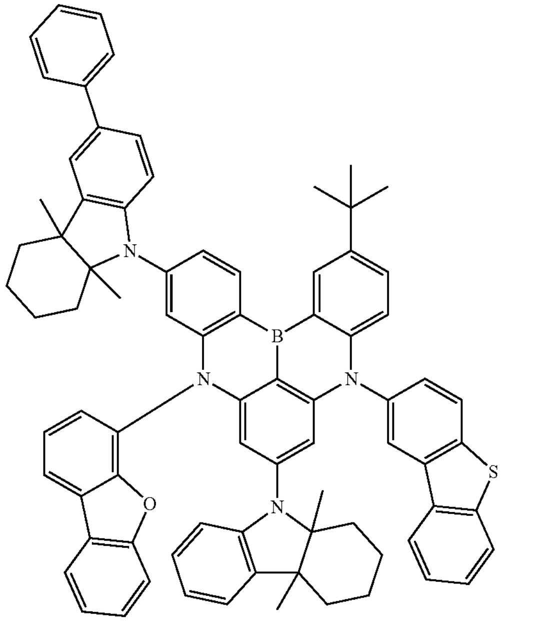
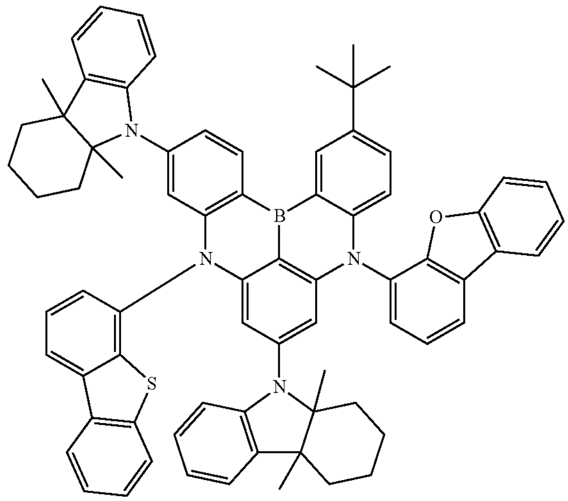

-continued
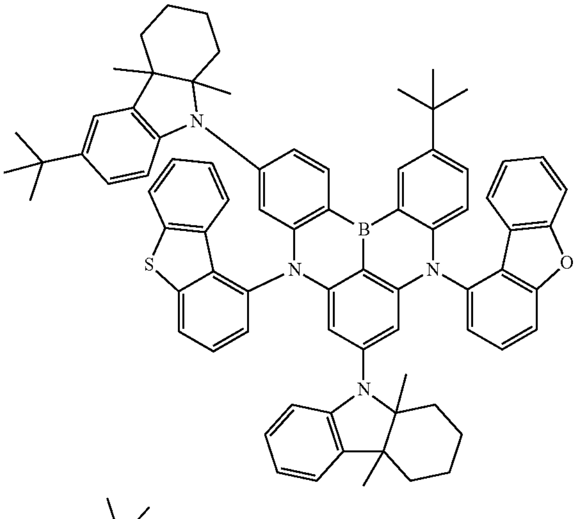
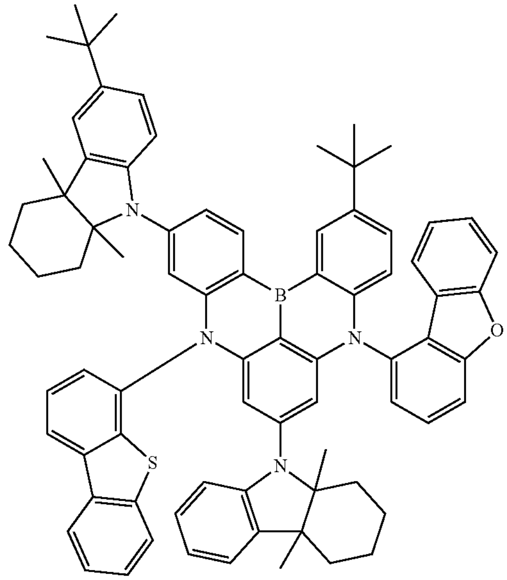
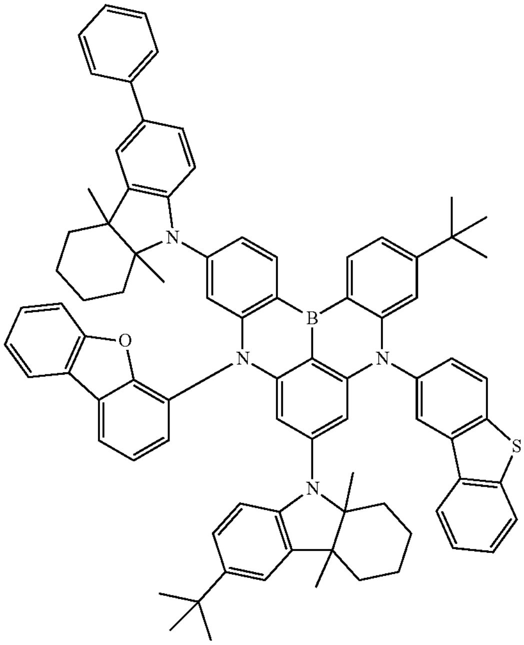
-continued
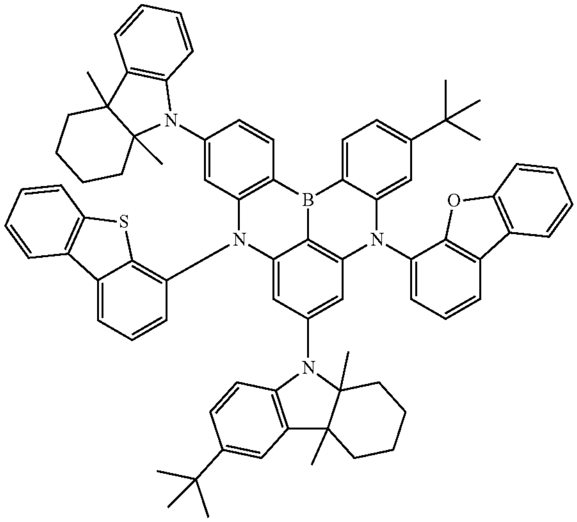
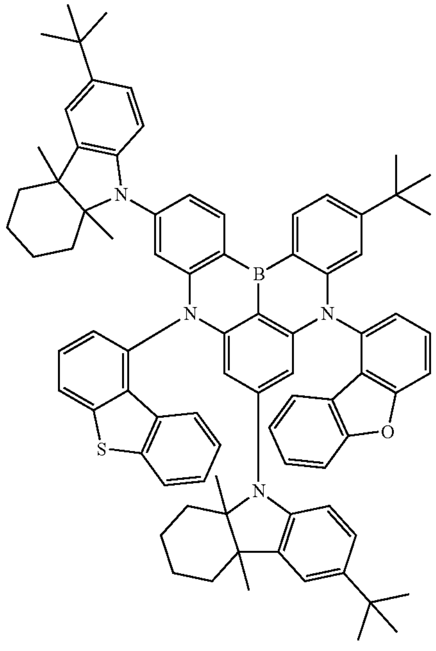

-continued
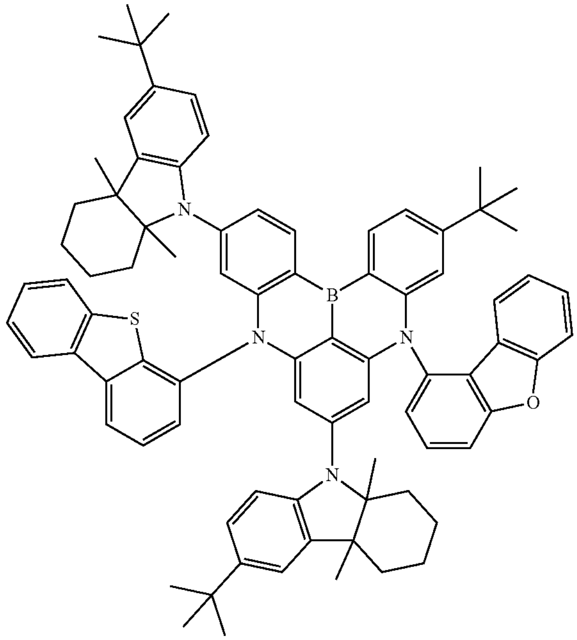
-continued
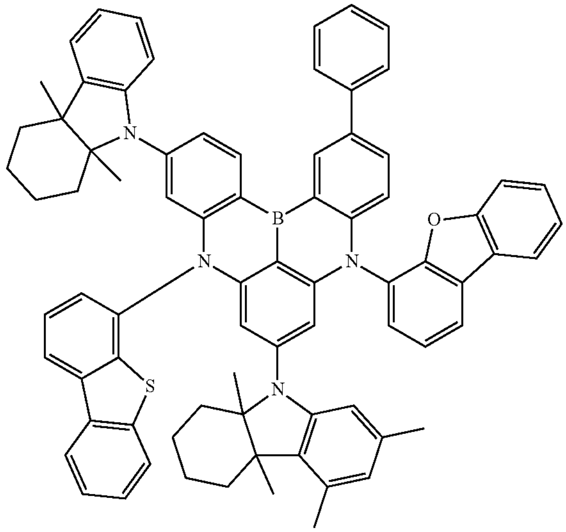
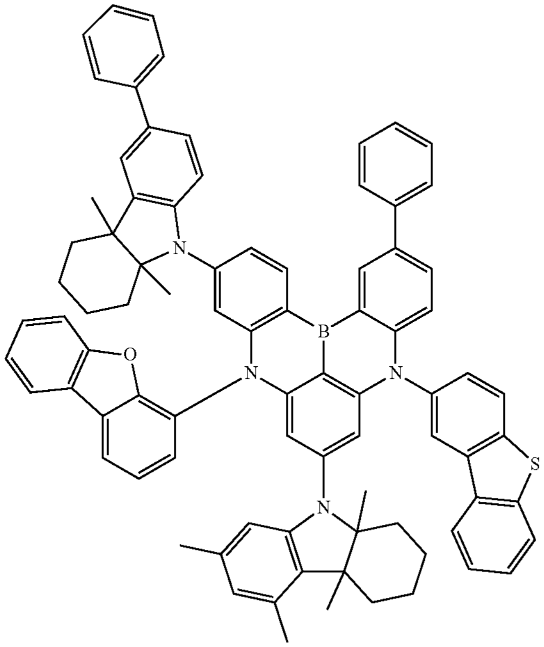
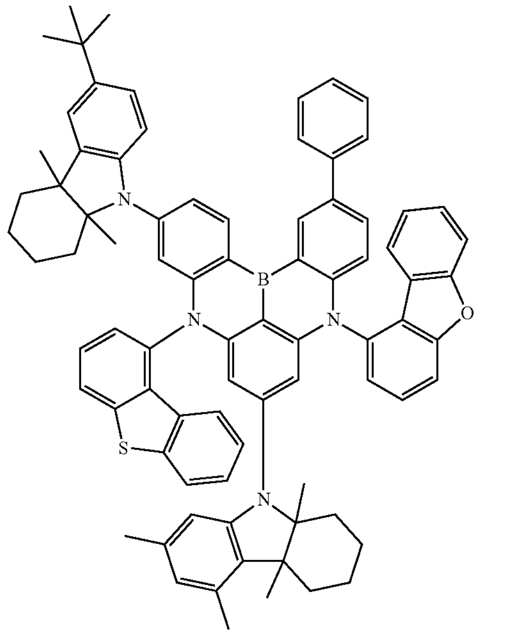

-continued
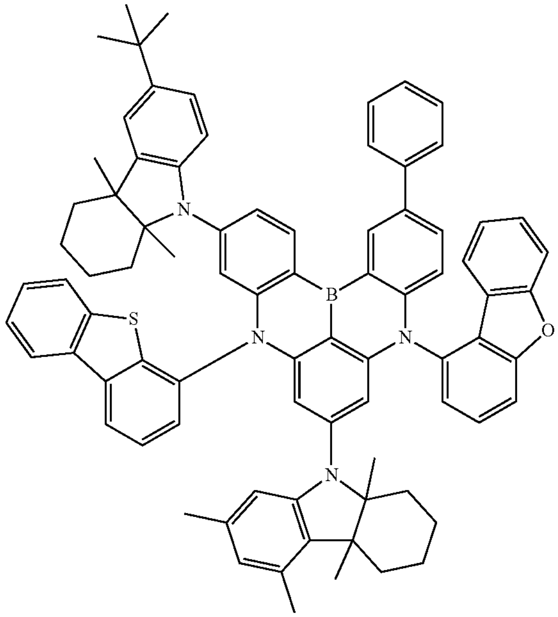
-continued
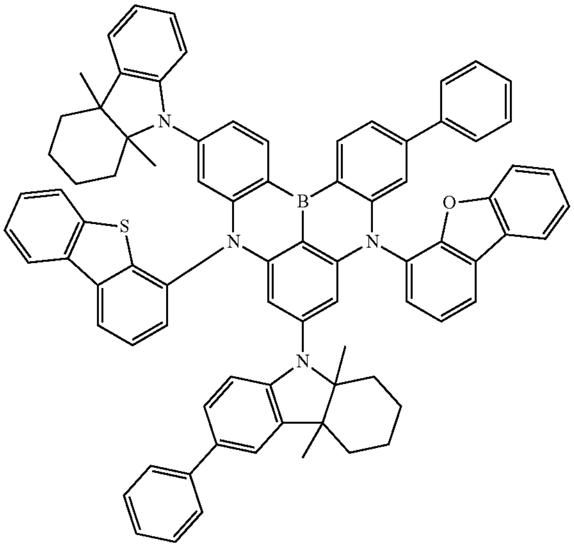
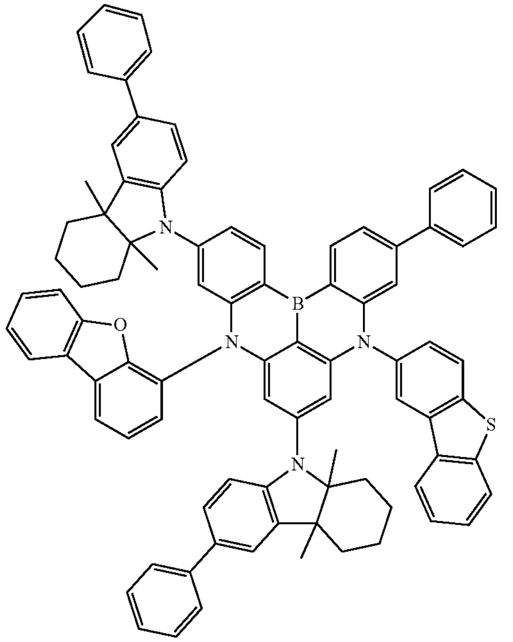
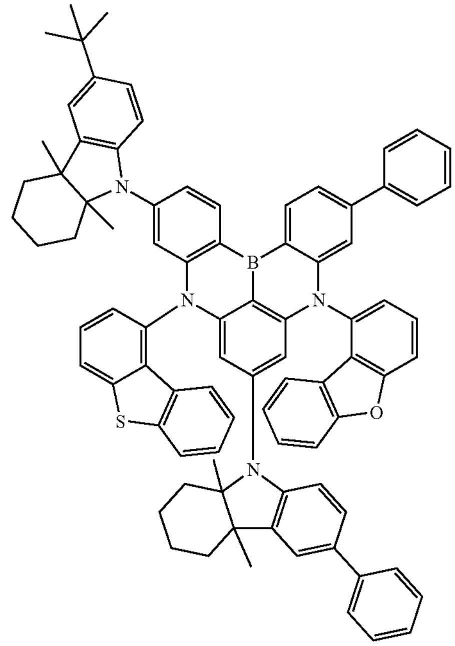

-continued
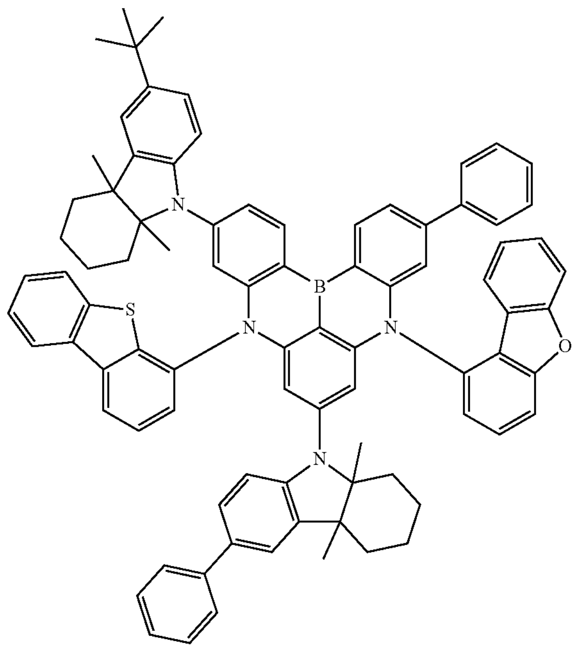
-continued
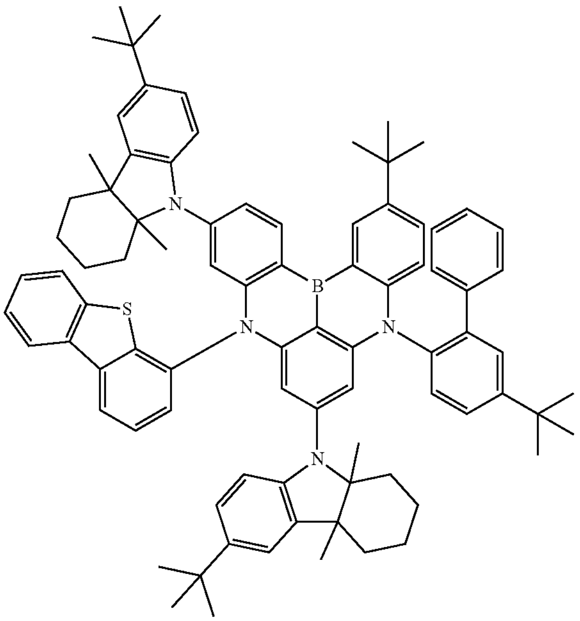
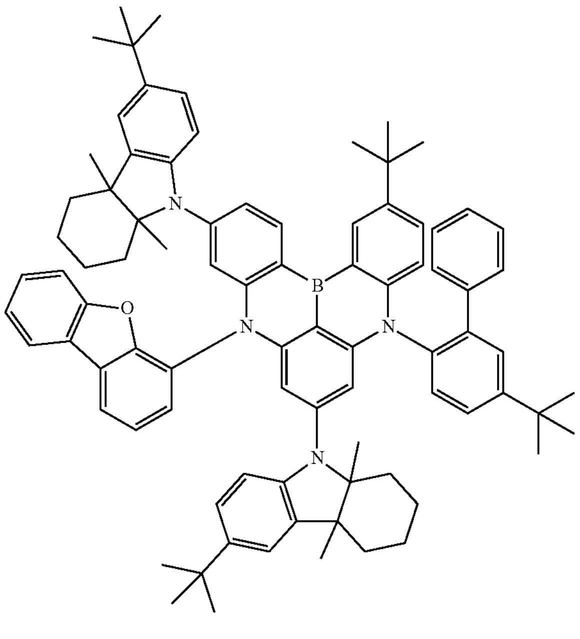
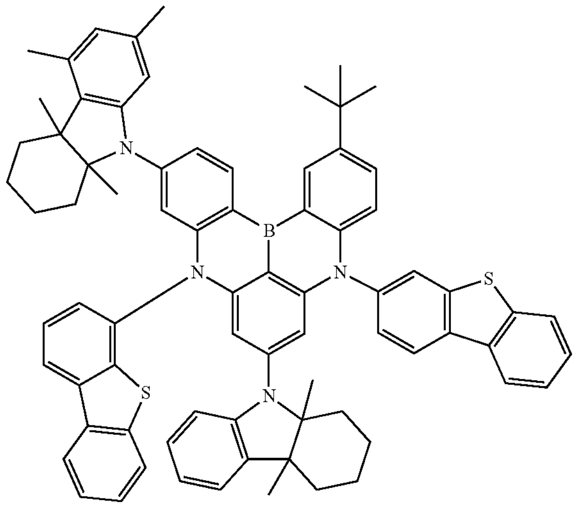

-continued
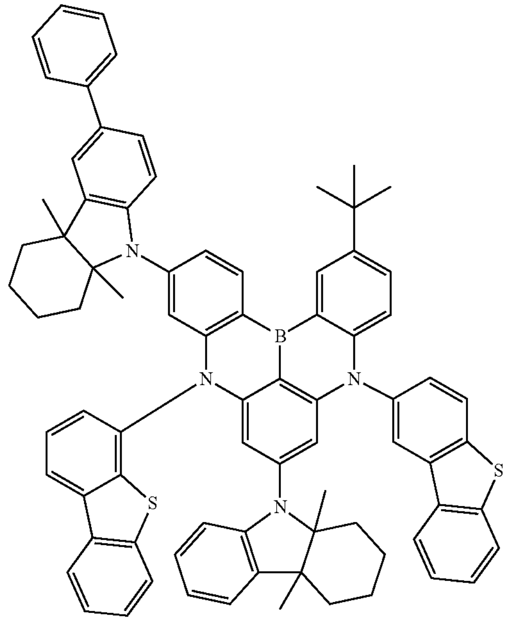
-continued
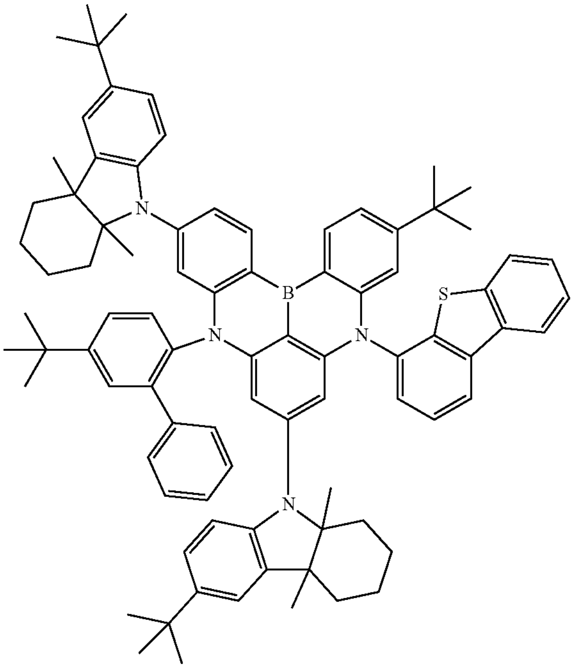
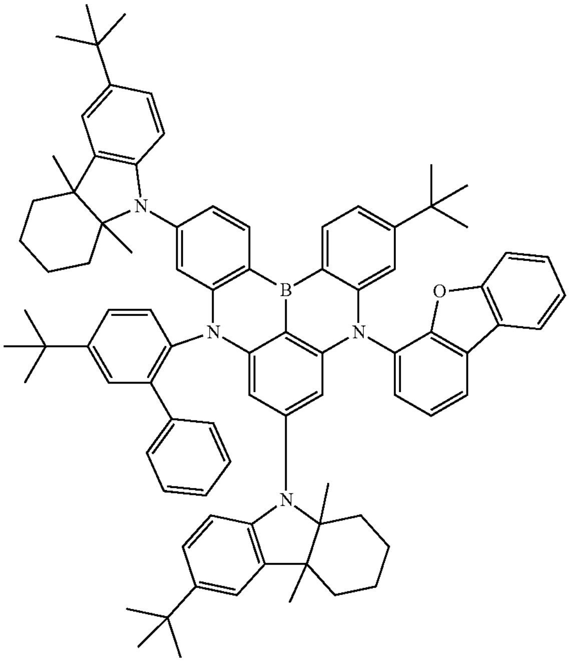
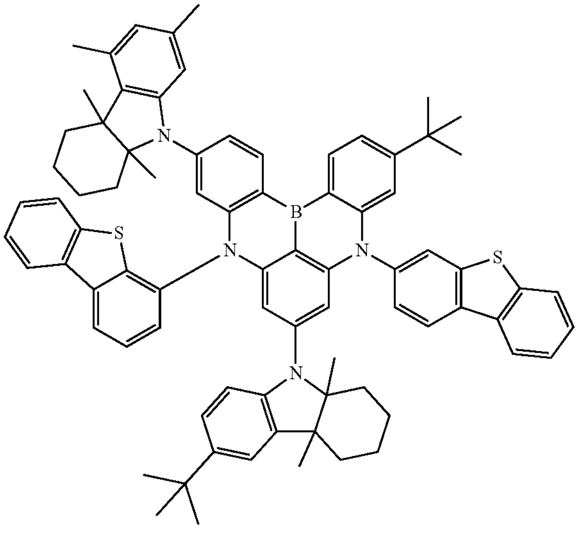

-continued
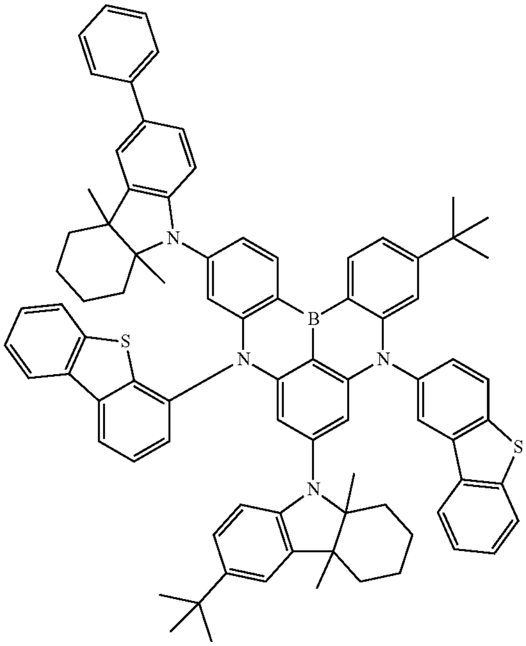
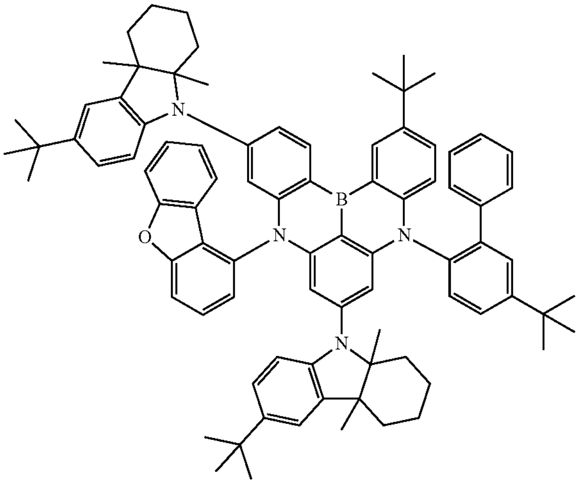
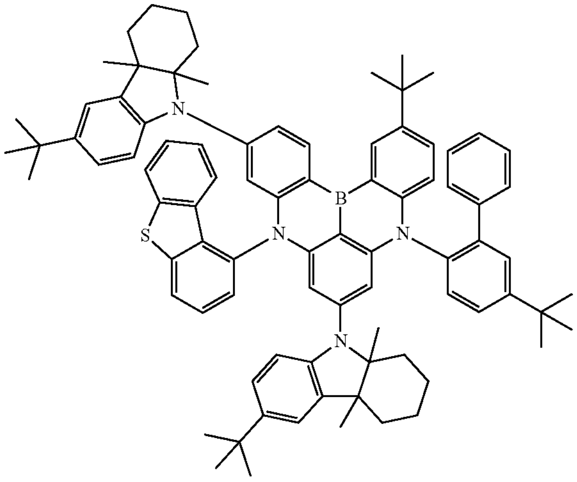
-continued
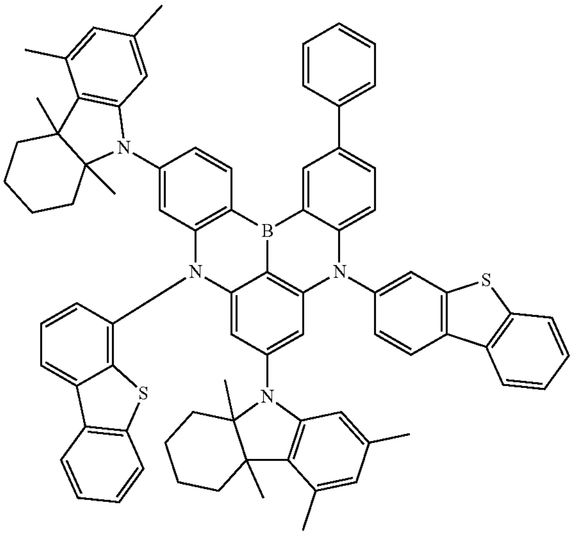
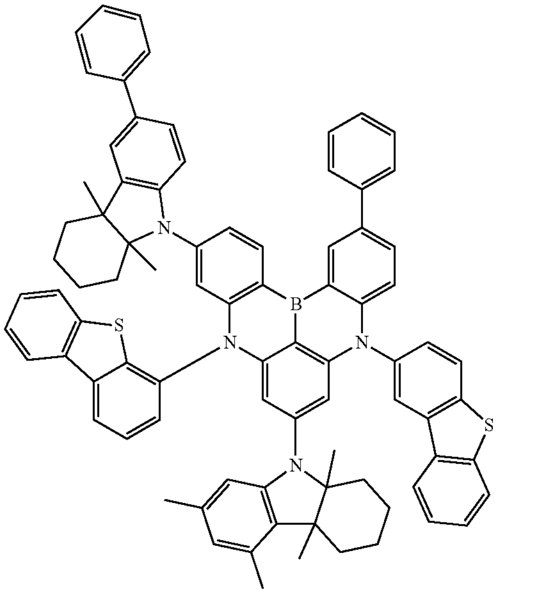

-continued
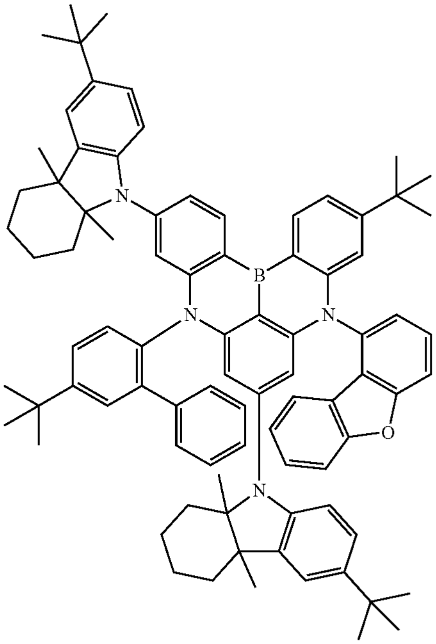
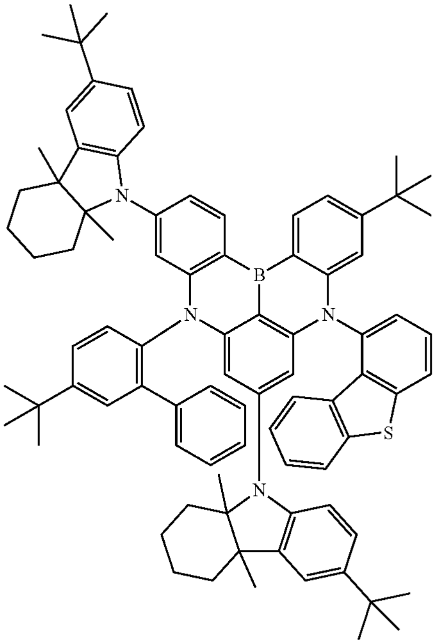
-continued
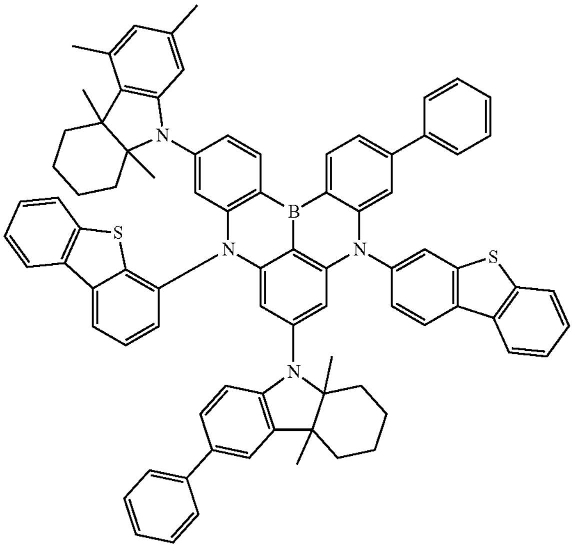
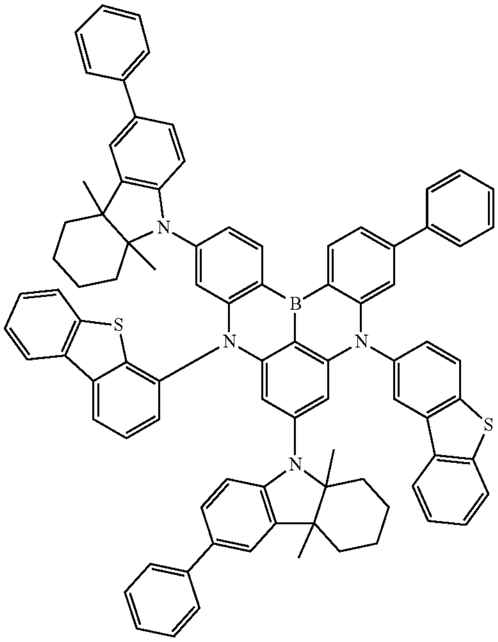

-continued
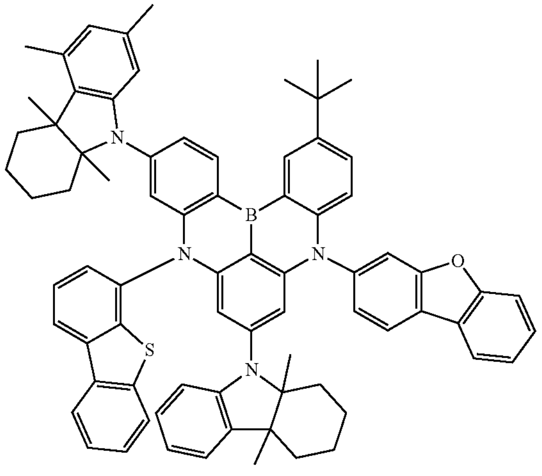
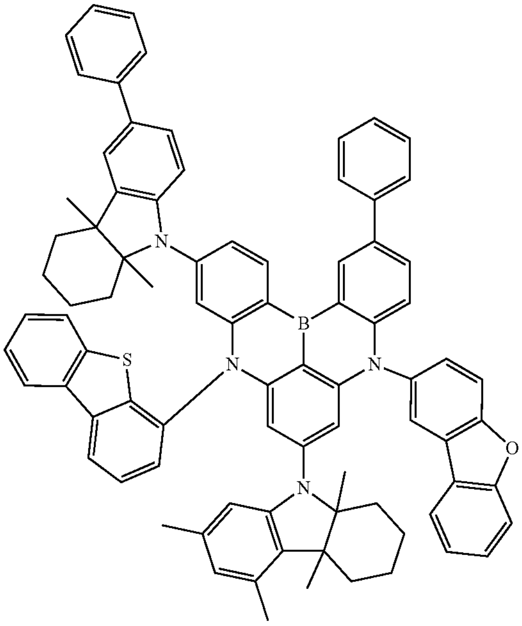
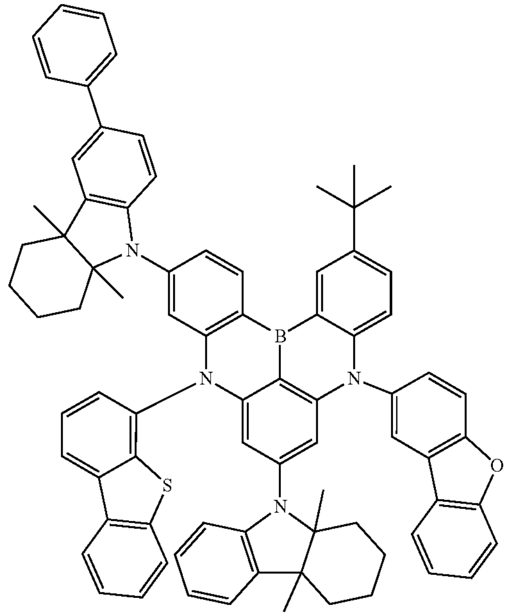
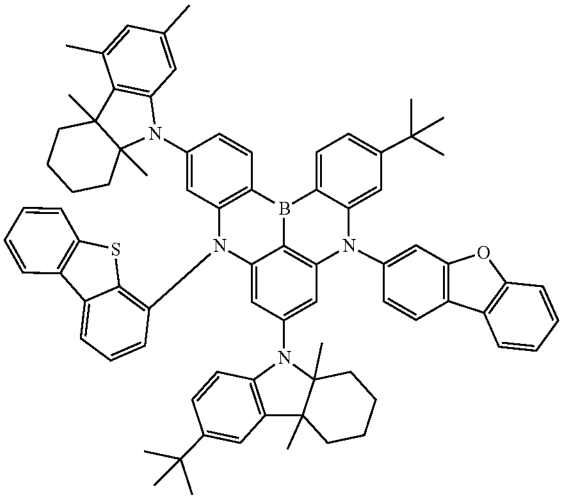
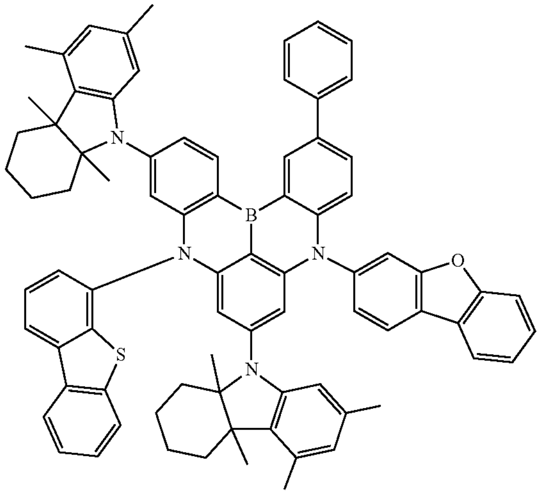

-continued
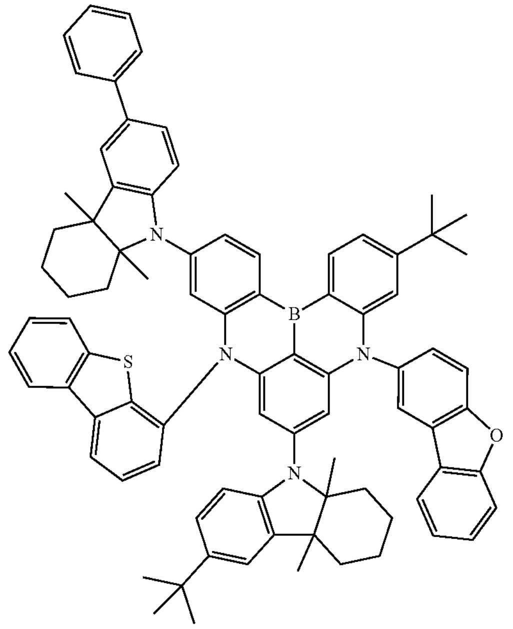
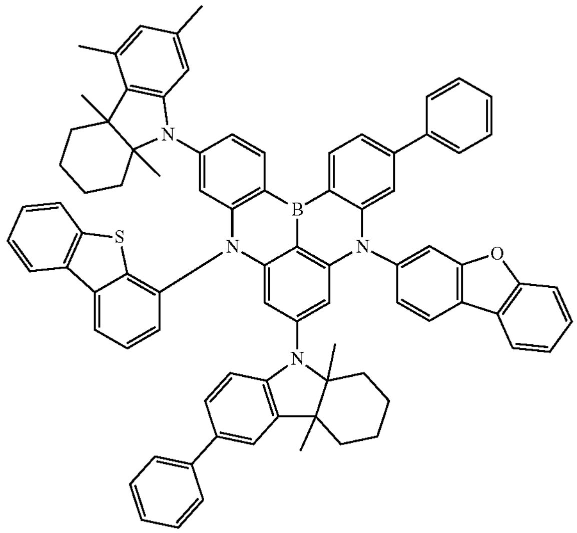
-continued
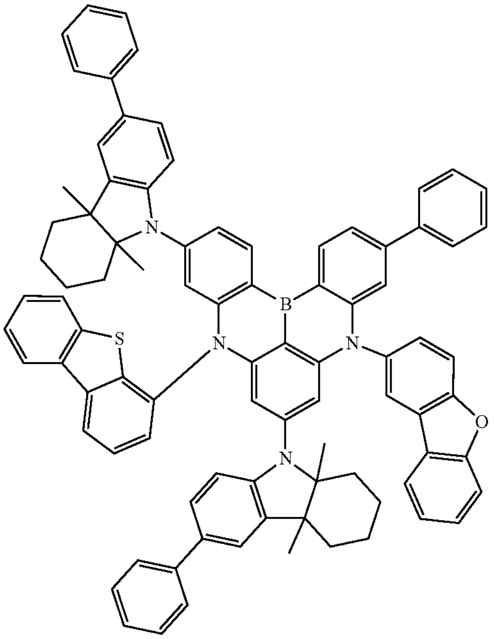
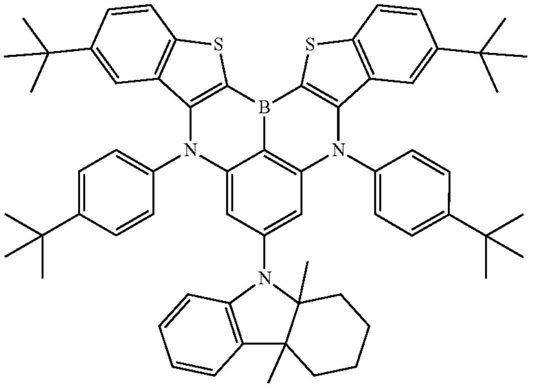
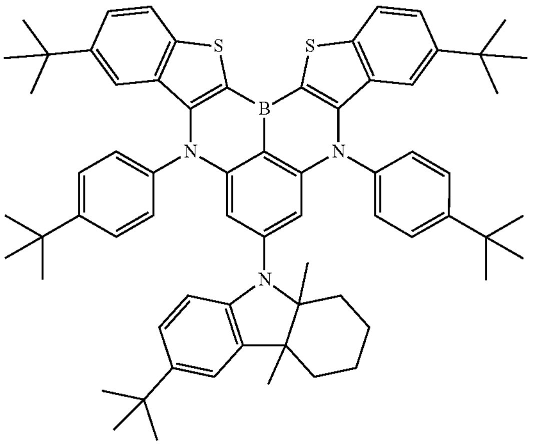

-continued
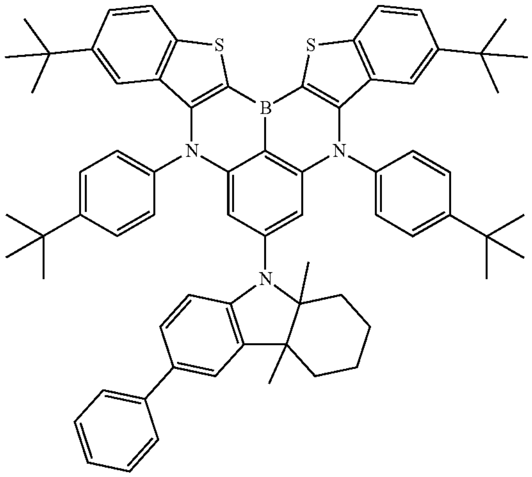
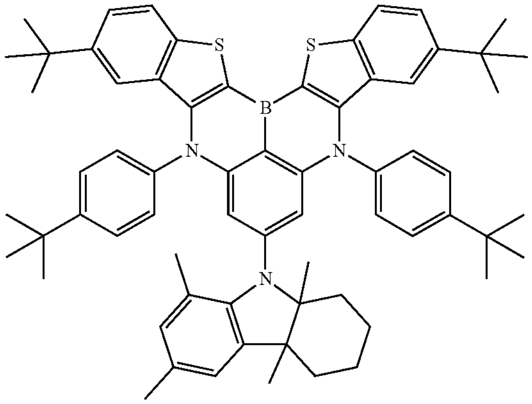
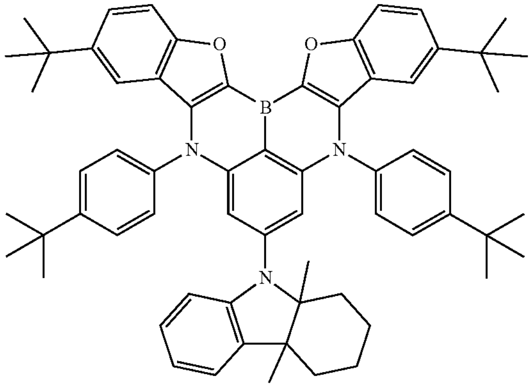
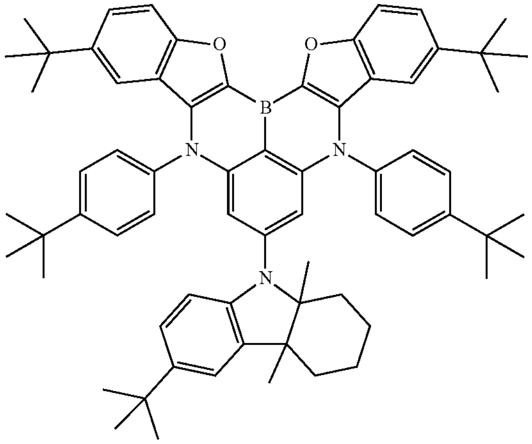
-continued
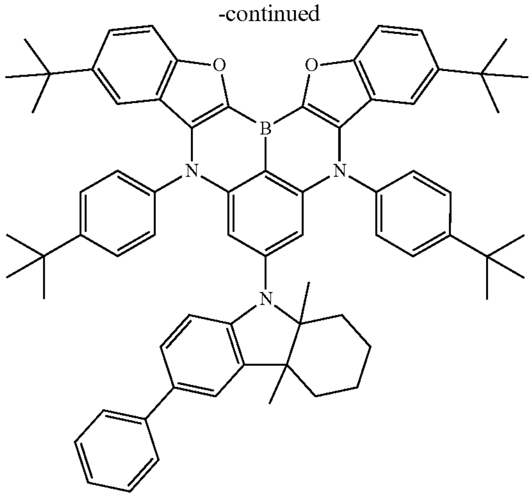
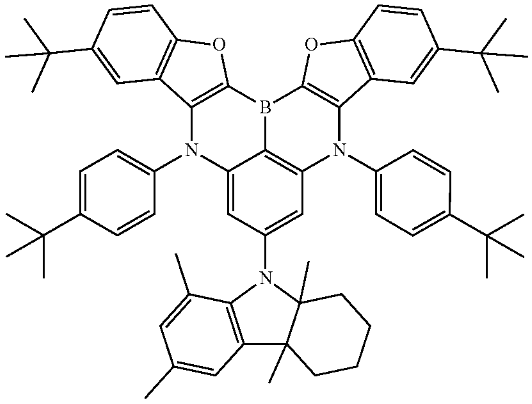
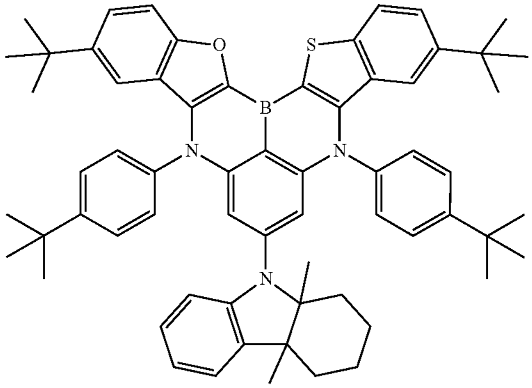
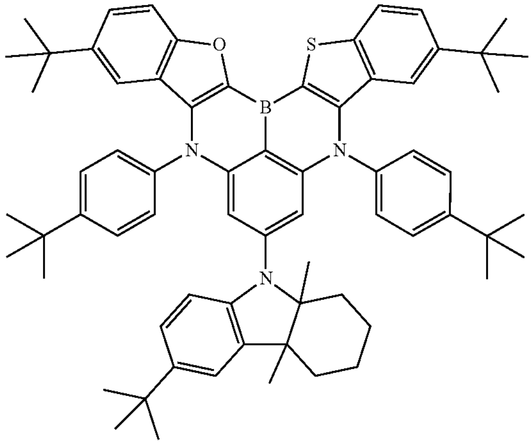

4951
-continued
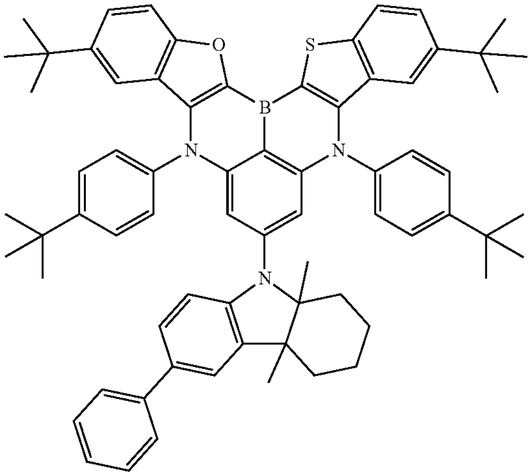
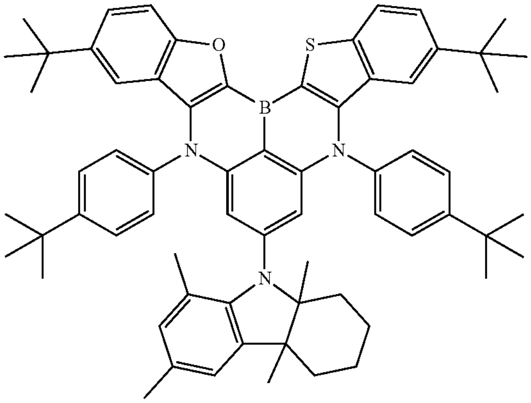
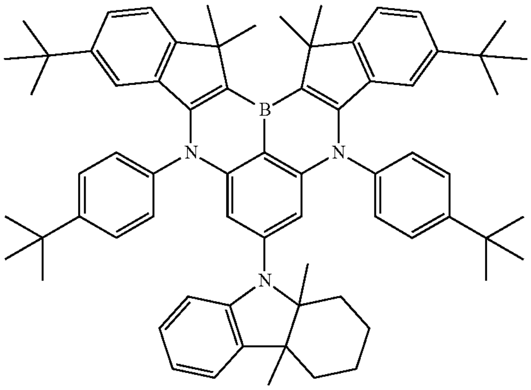
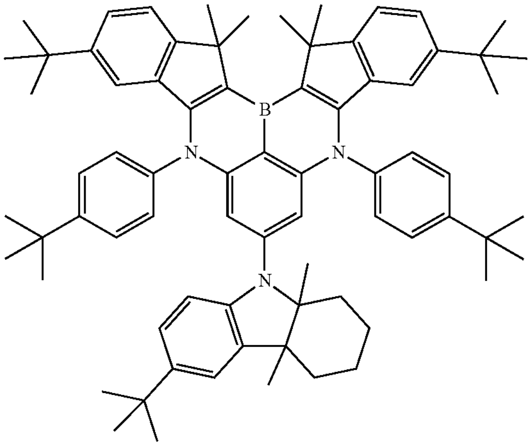
4952
-continued
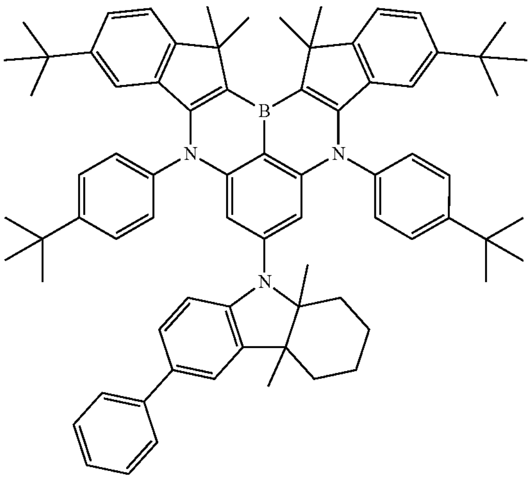
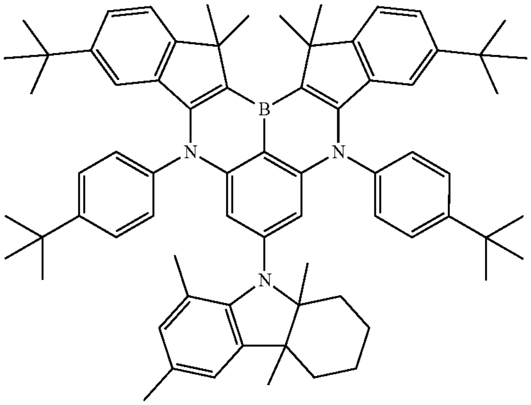
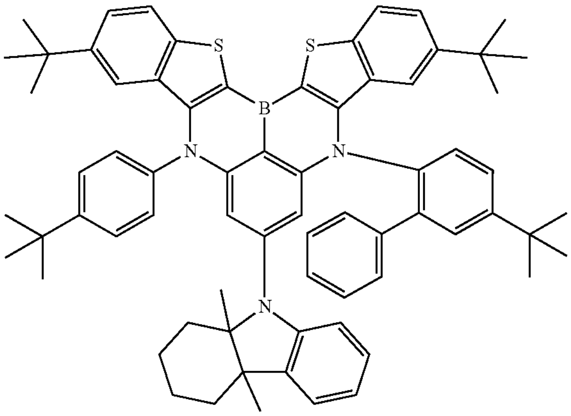

-continued
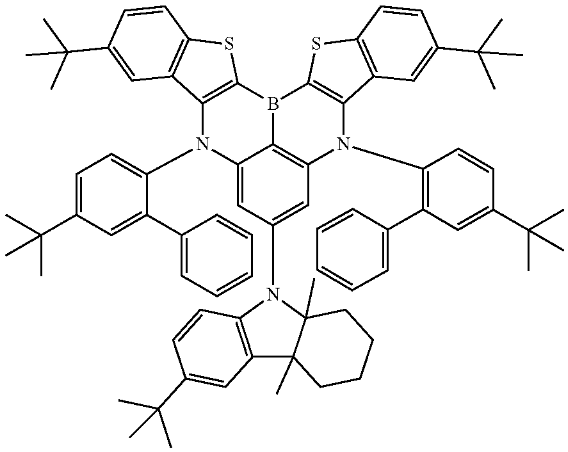
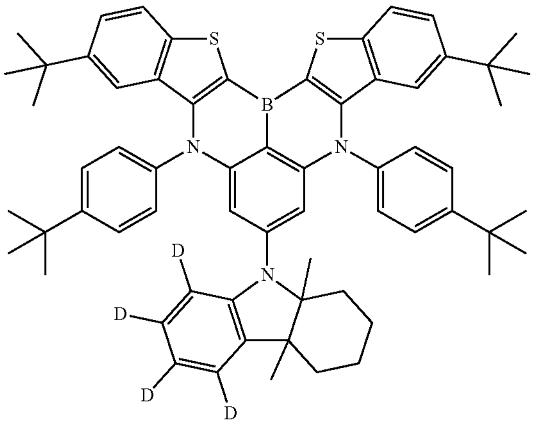
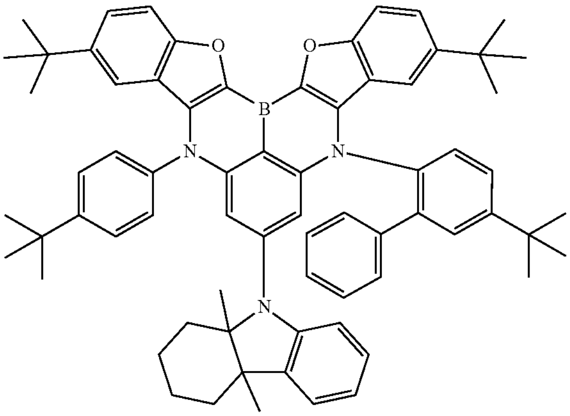
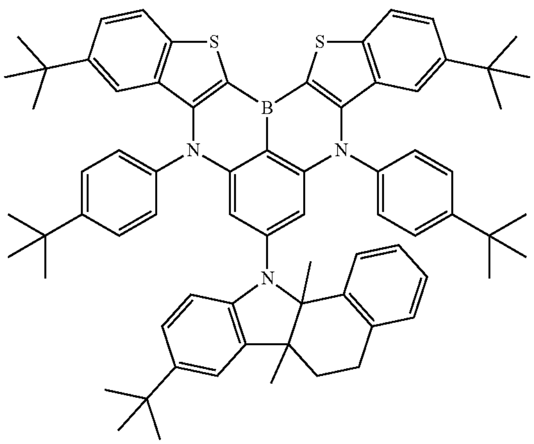
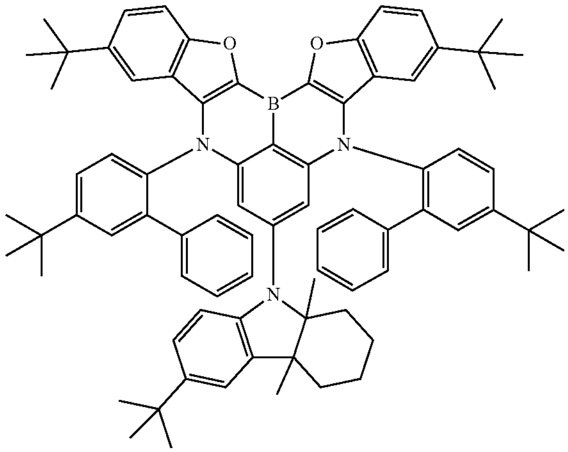
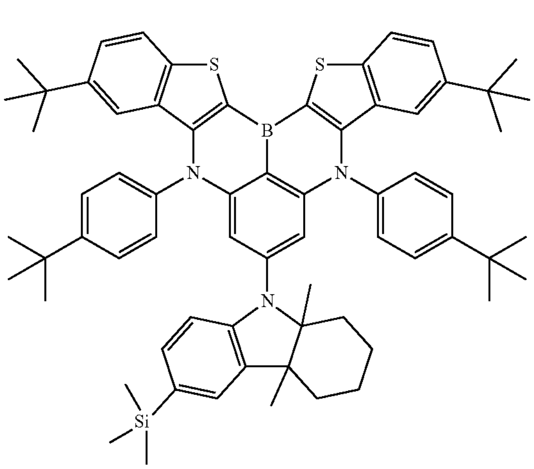

-continued
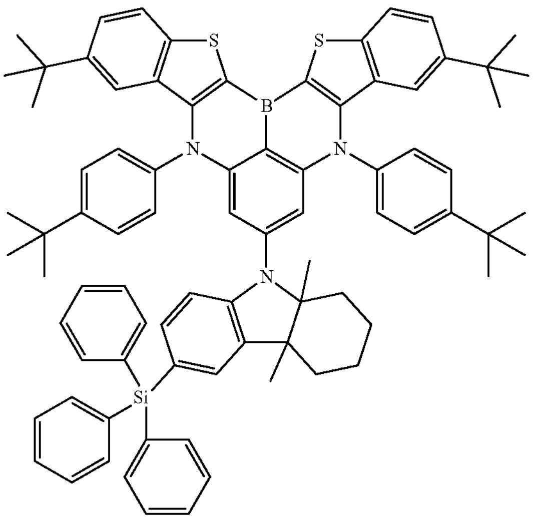
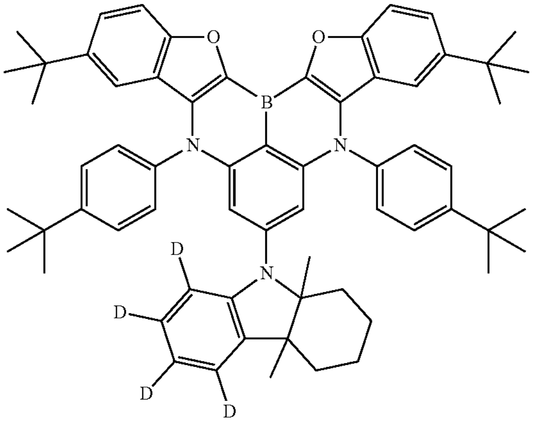
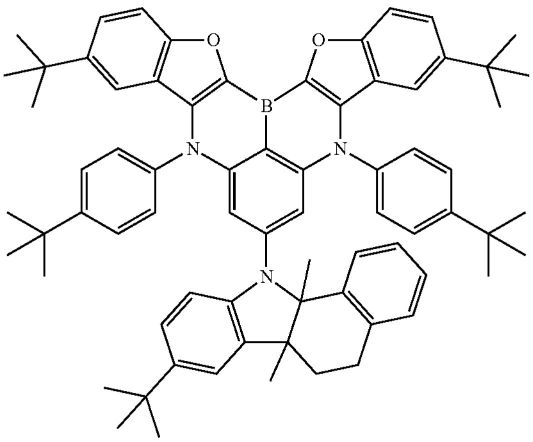
-continued
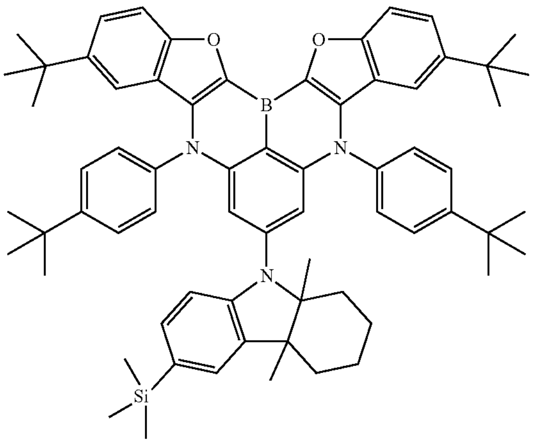
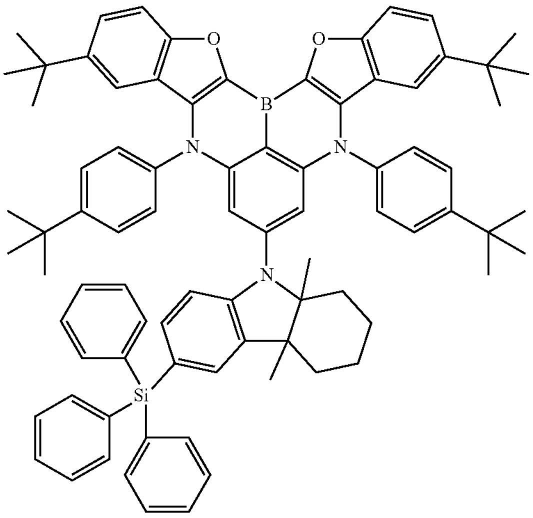
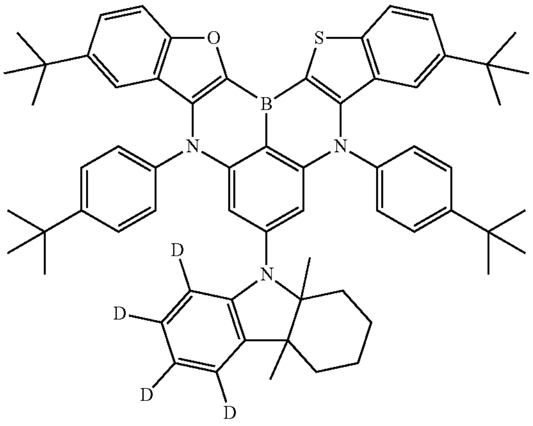

-continued
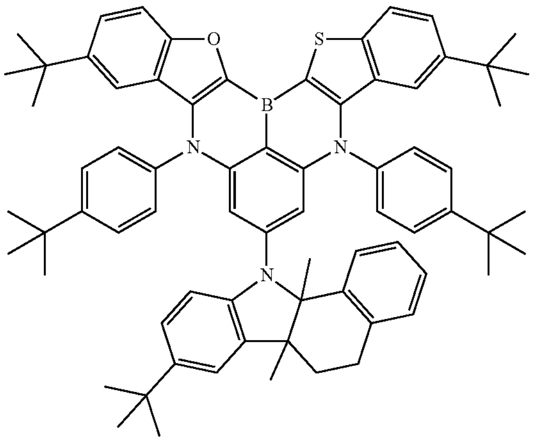
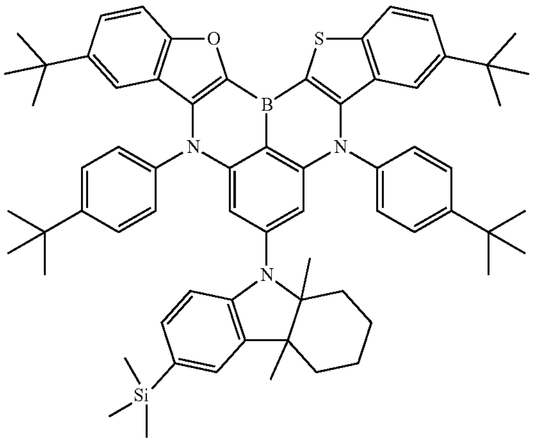
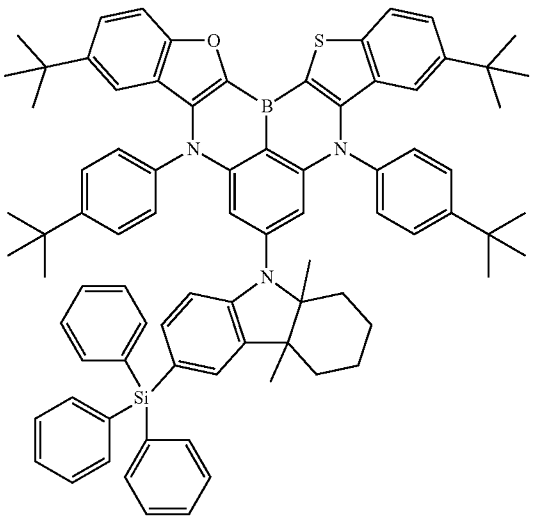
-continued
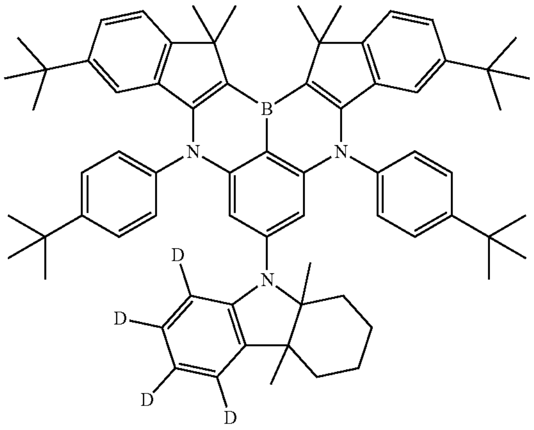
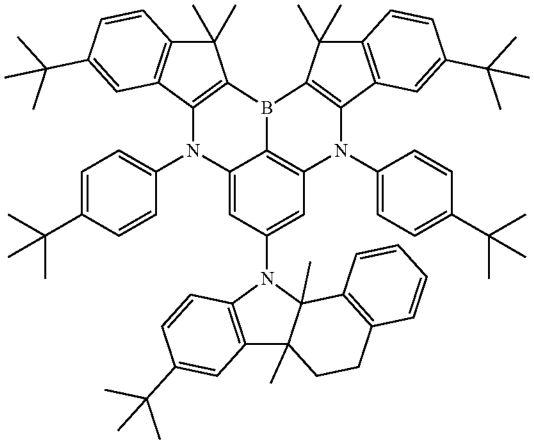
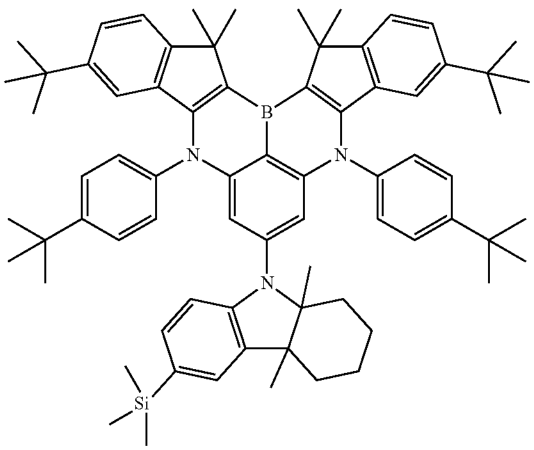

-continued
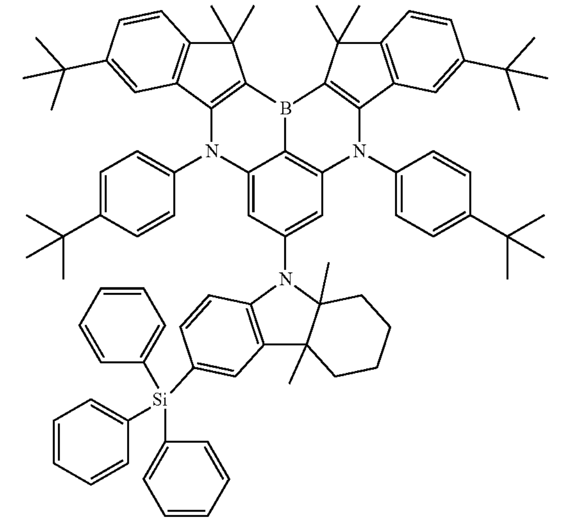
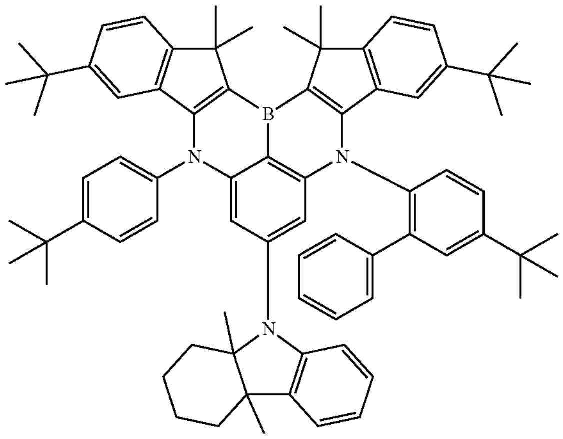
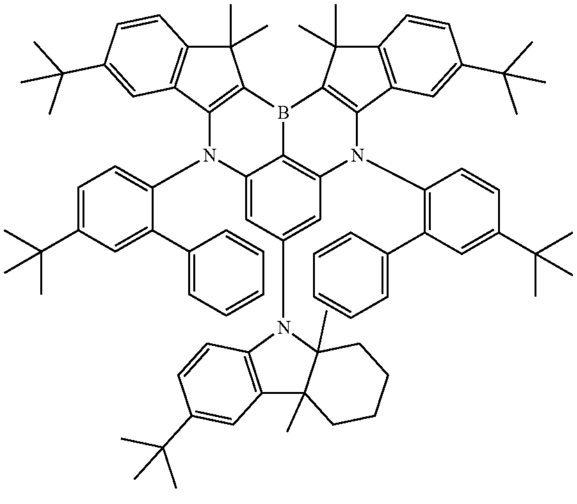
-continued
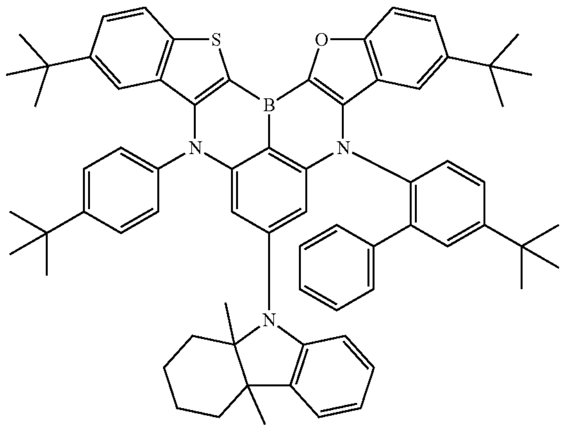
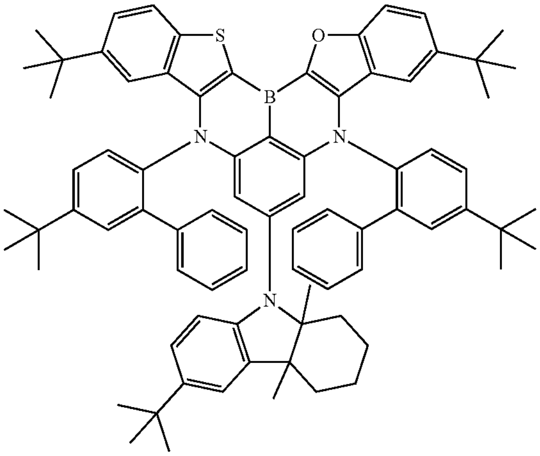
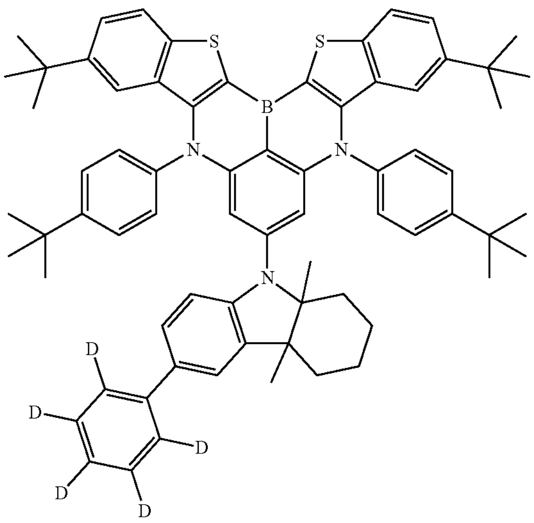

-continued
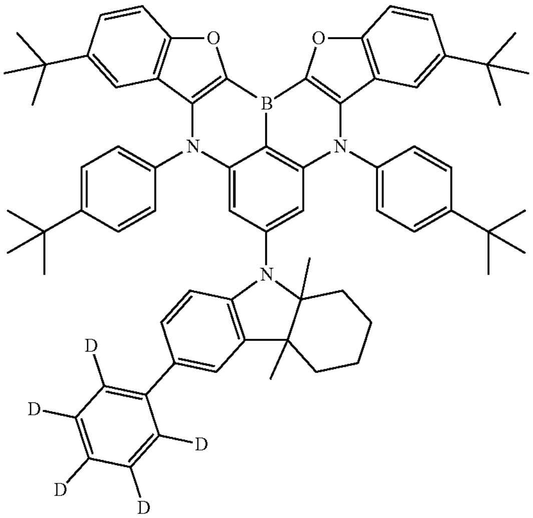
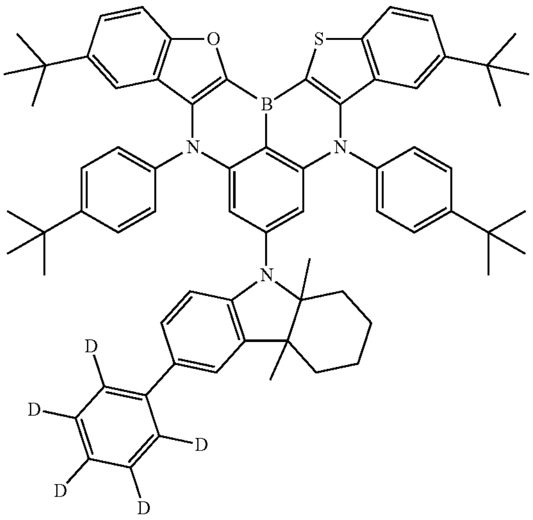
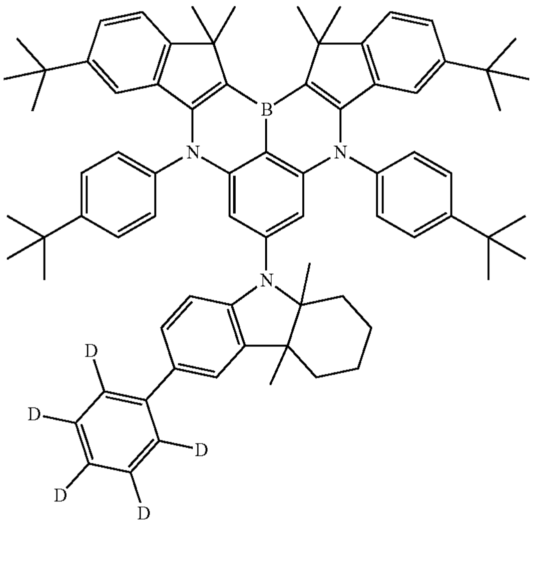
-continued
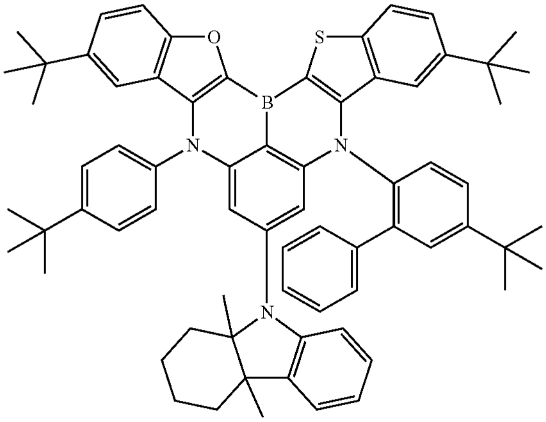
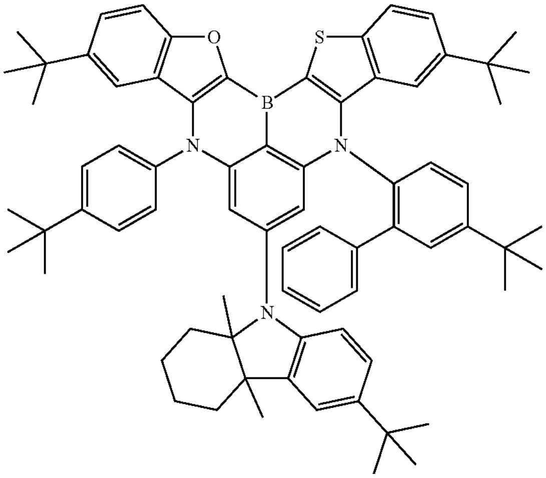
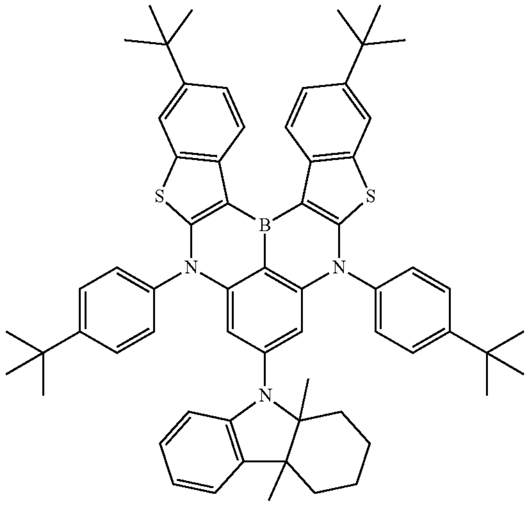

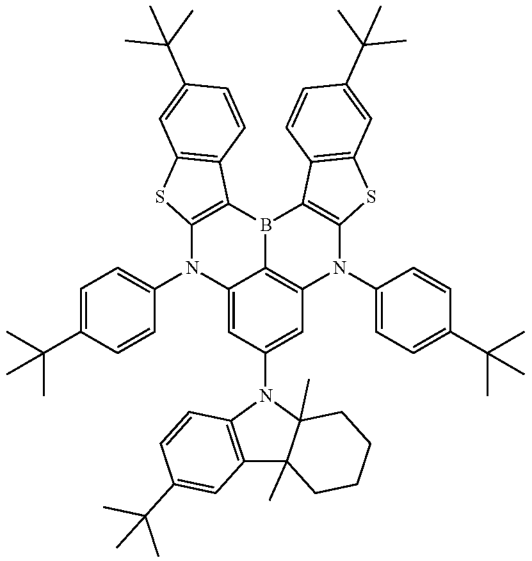
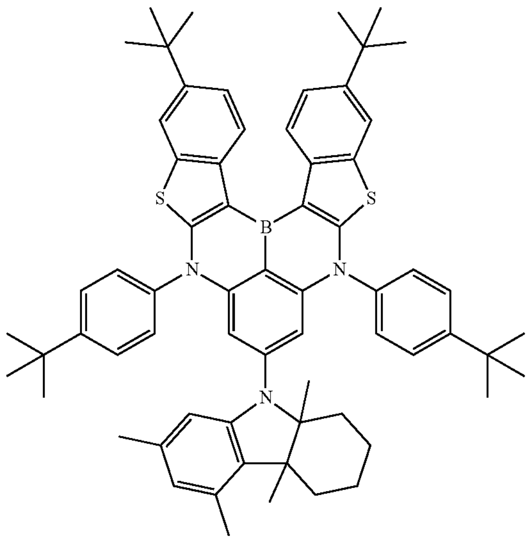
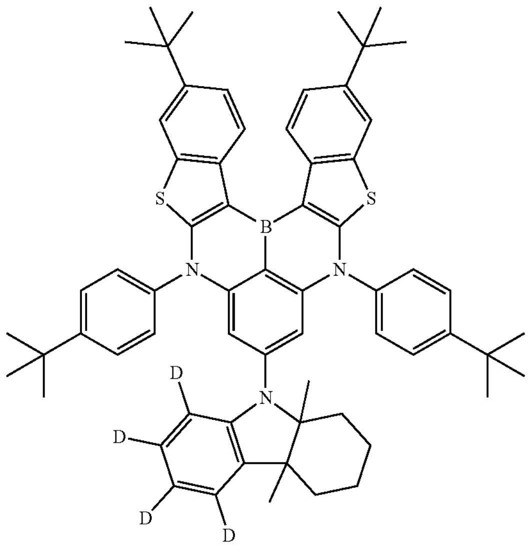
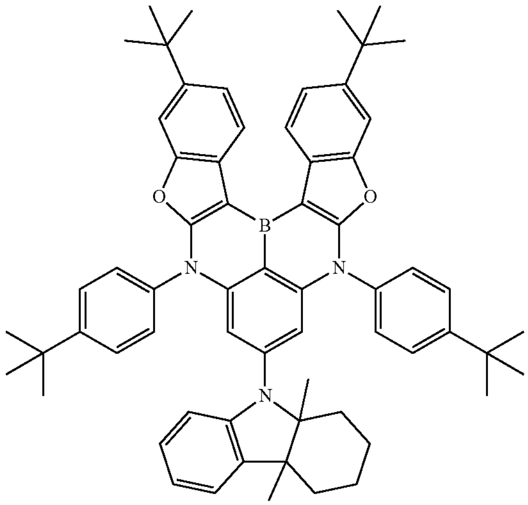
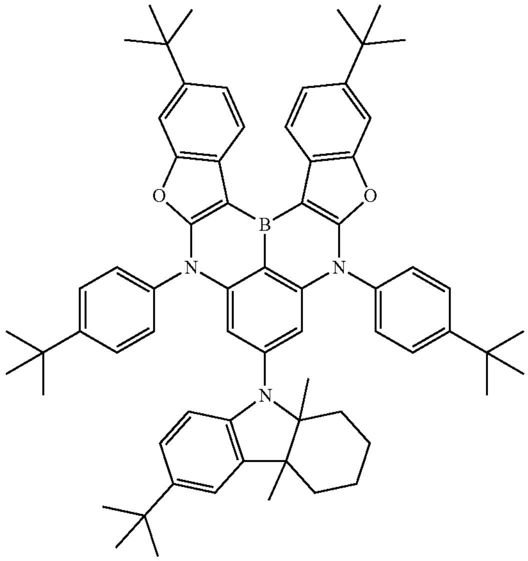
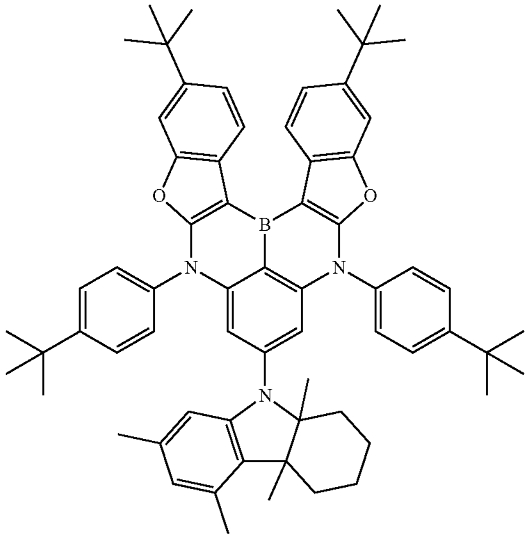

-continued
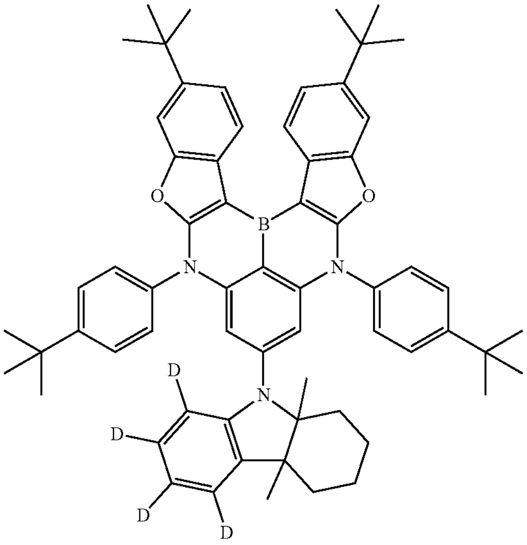
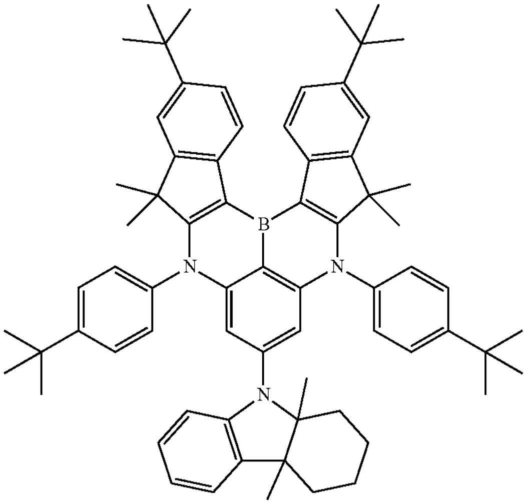
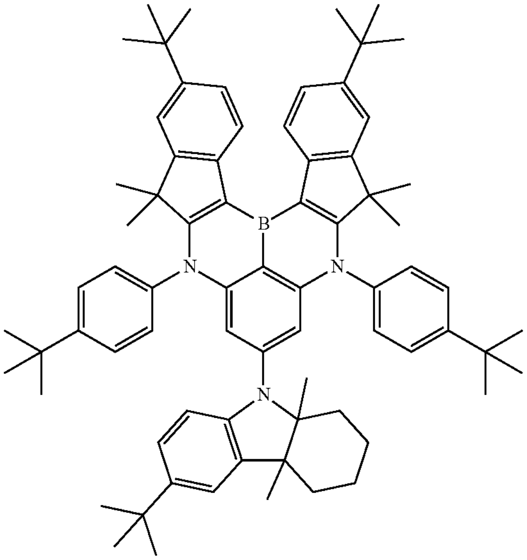
-continued
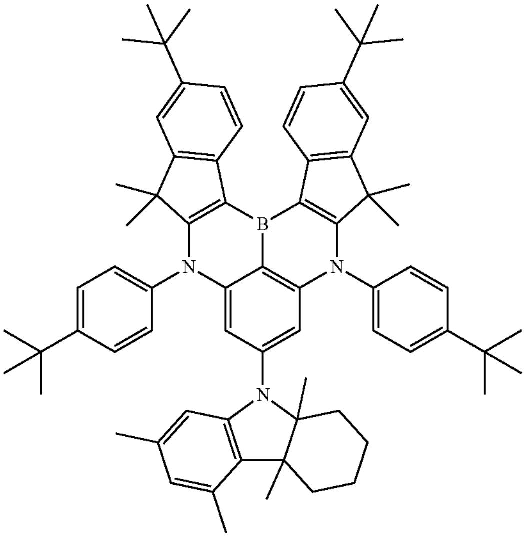
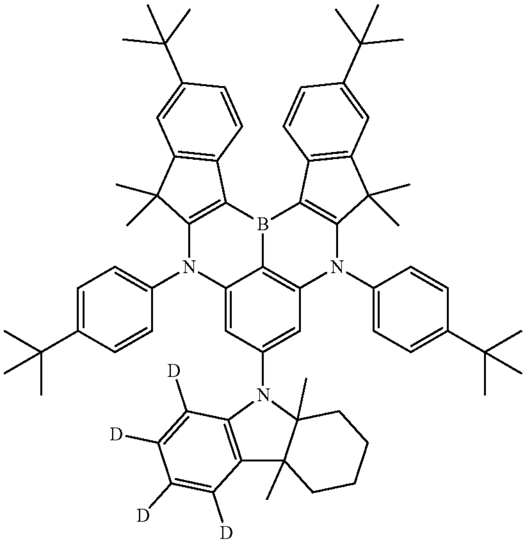
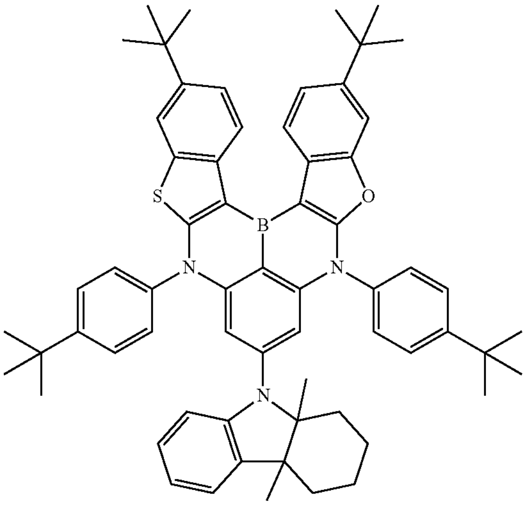

-continued
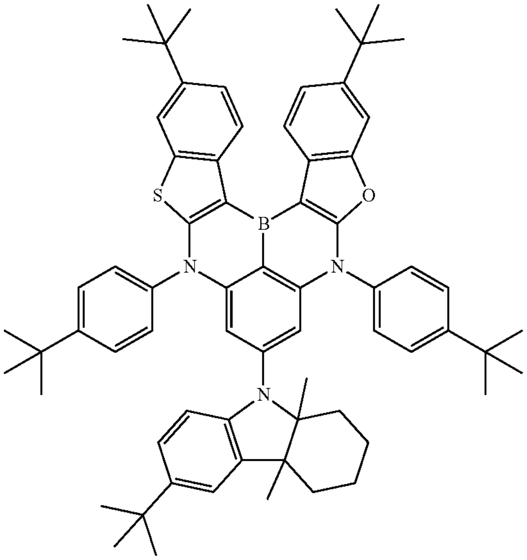
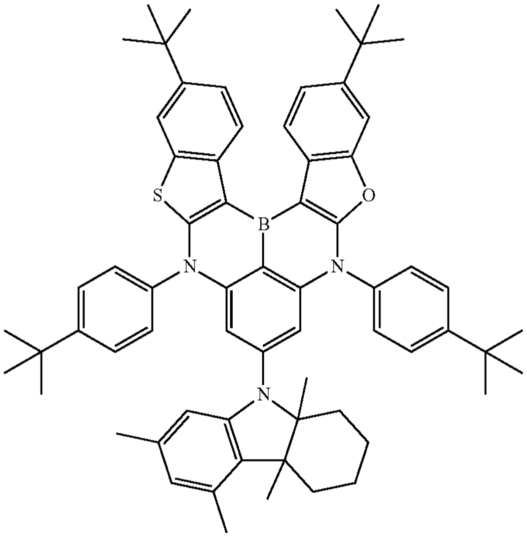
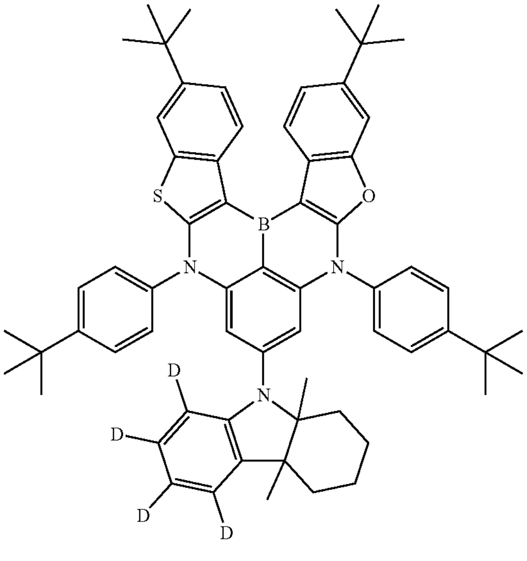
-continued
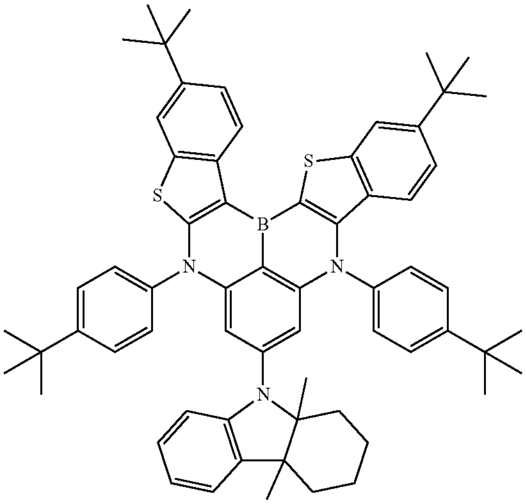
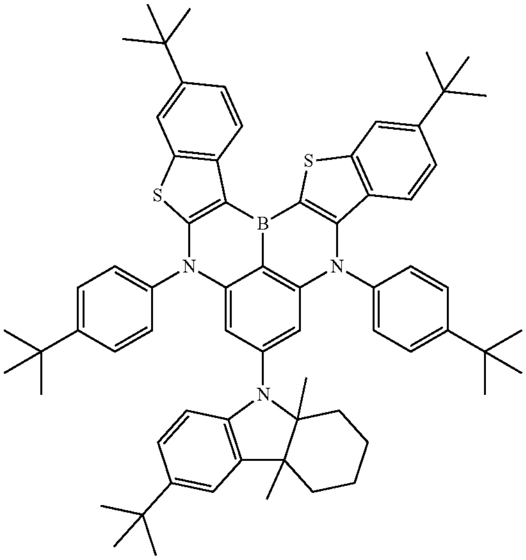
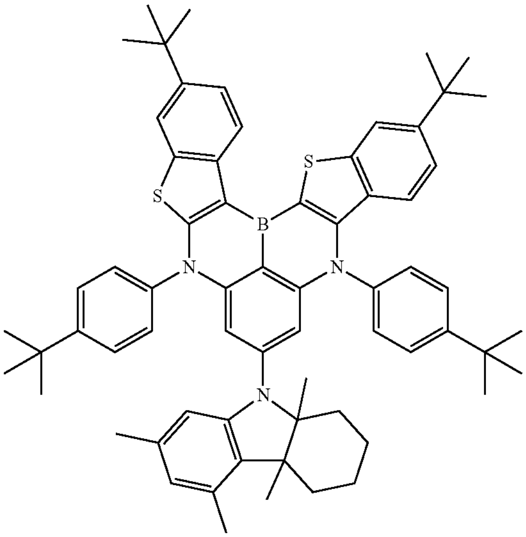

-continued
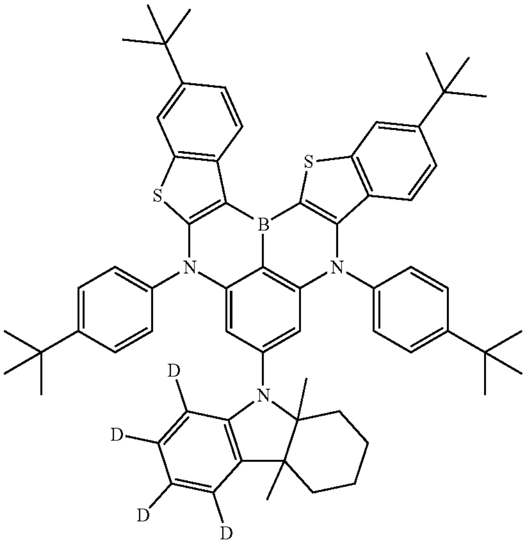
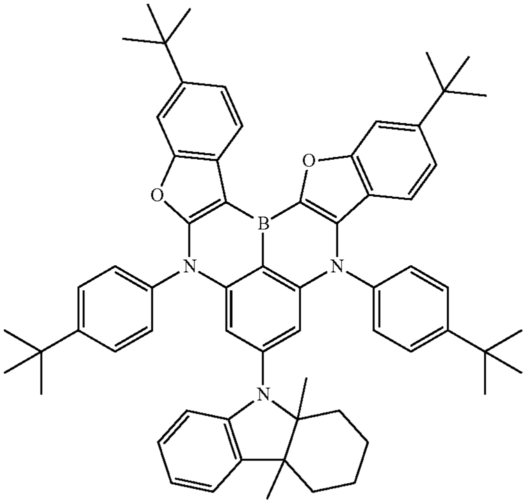
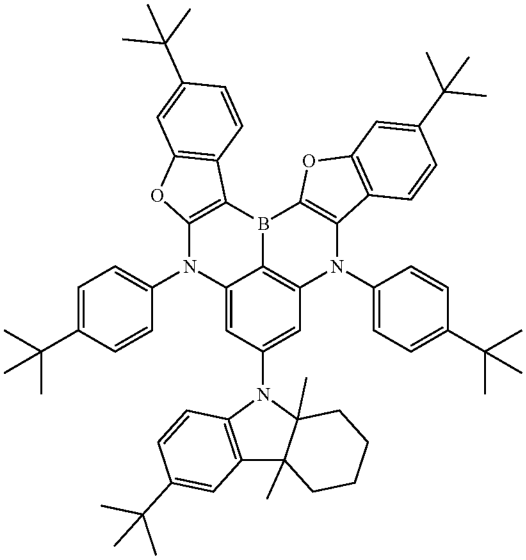
-continued
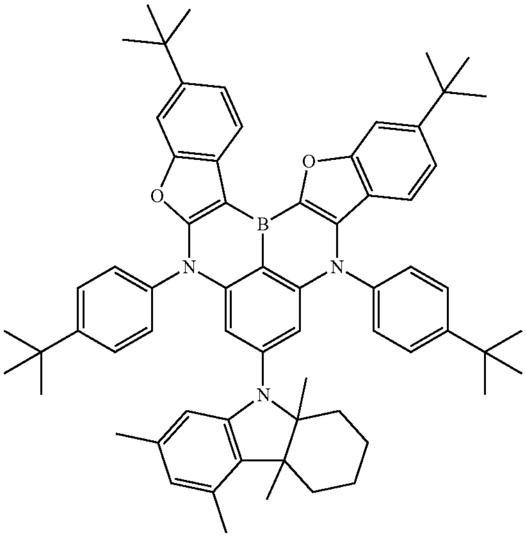
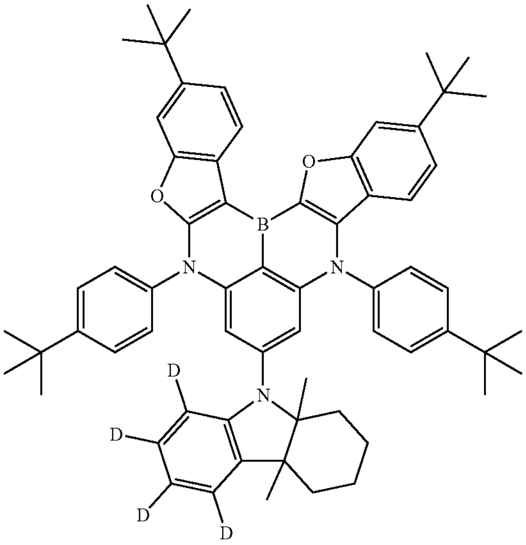
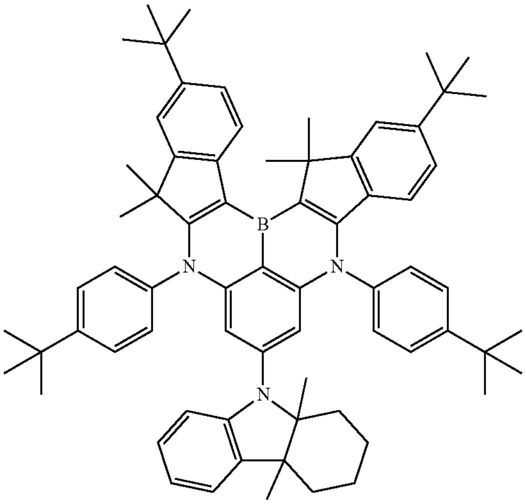

-continued
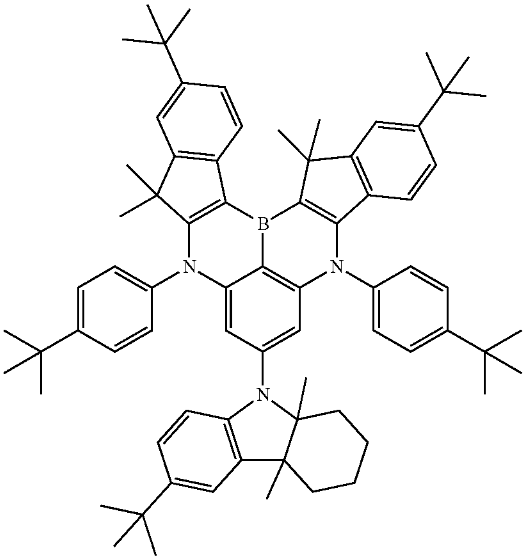
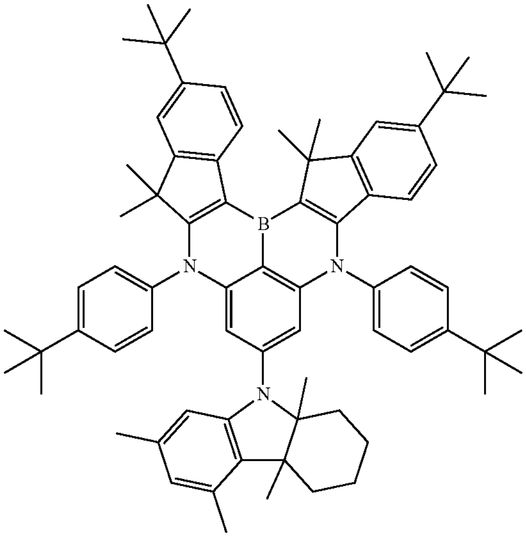
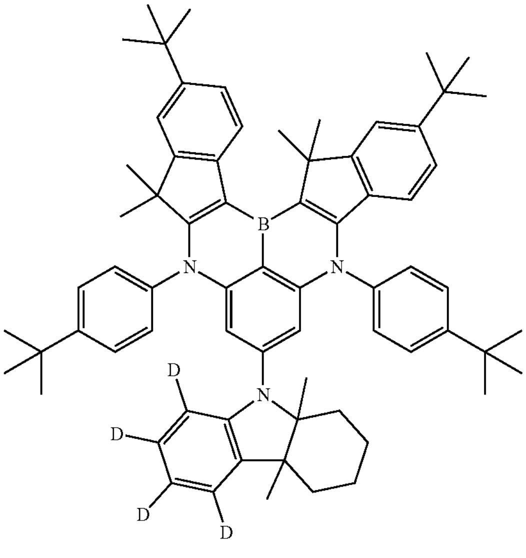
-continued
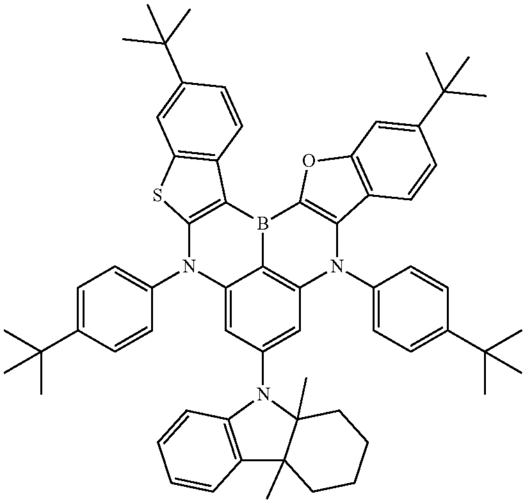
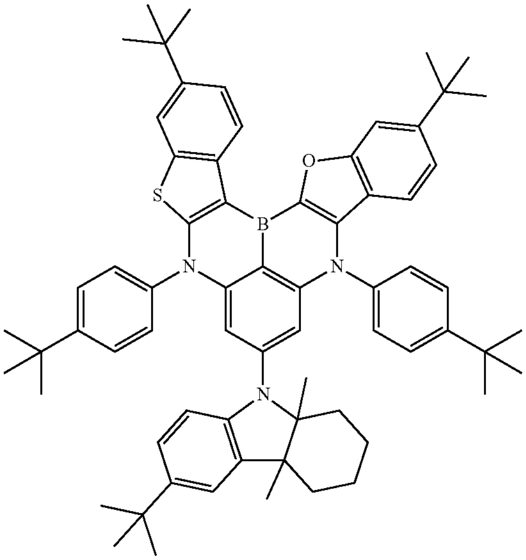
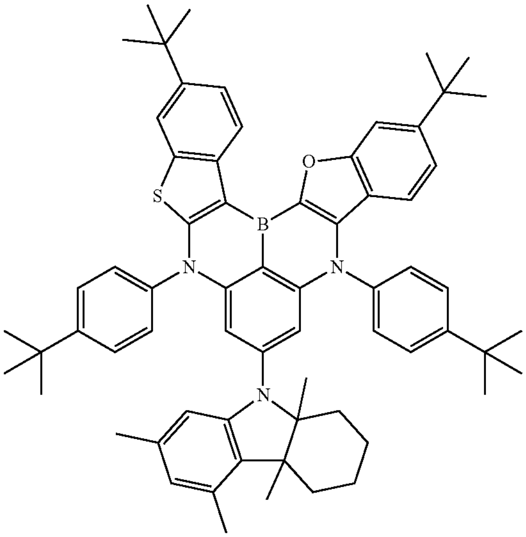

-continued
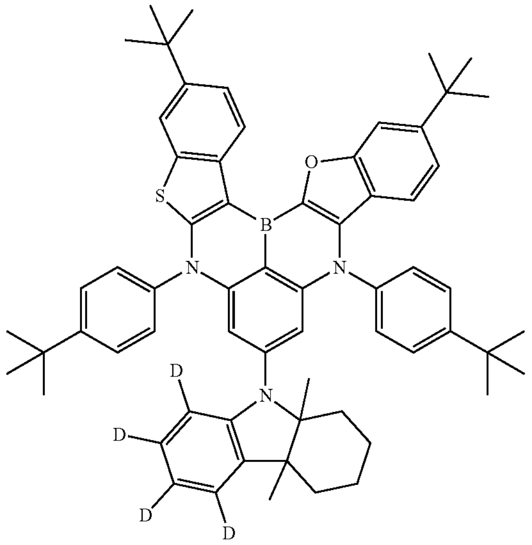
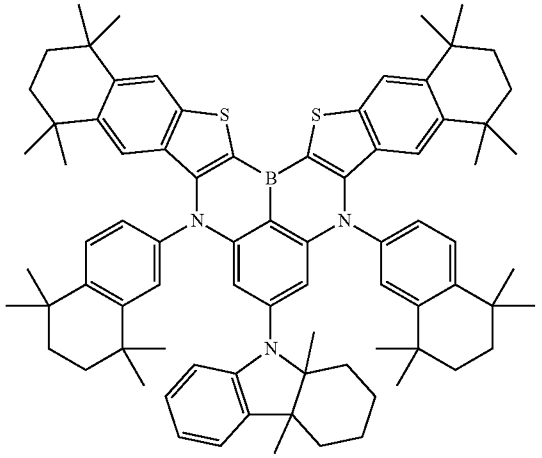
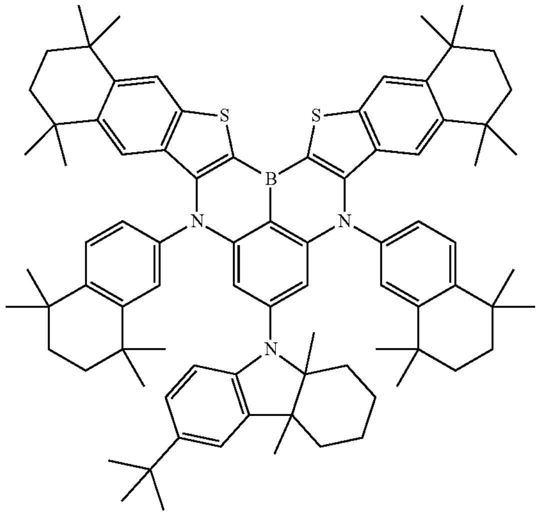
-continued
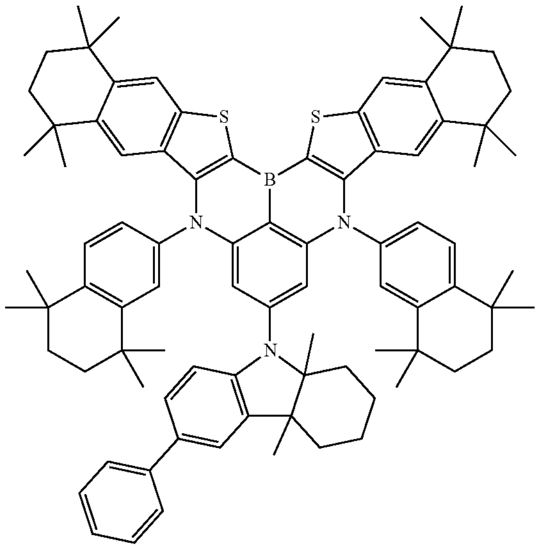
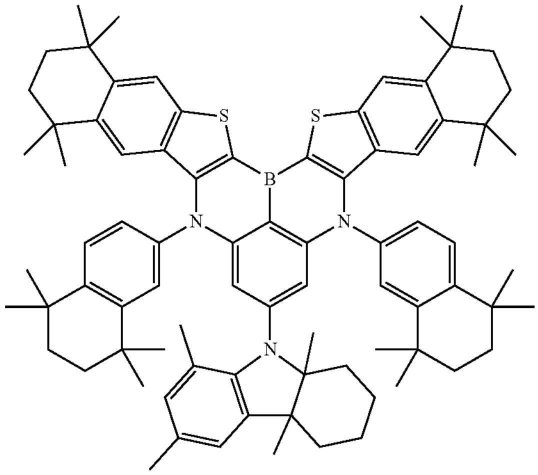
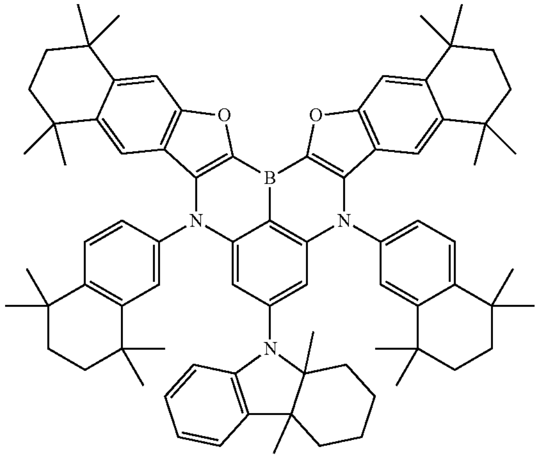

-continued
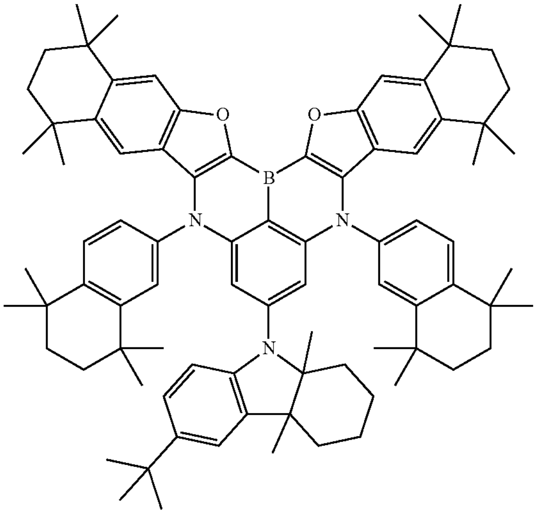
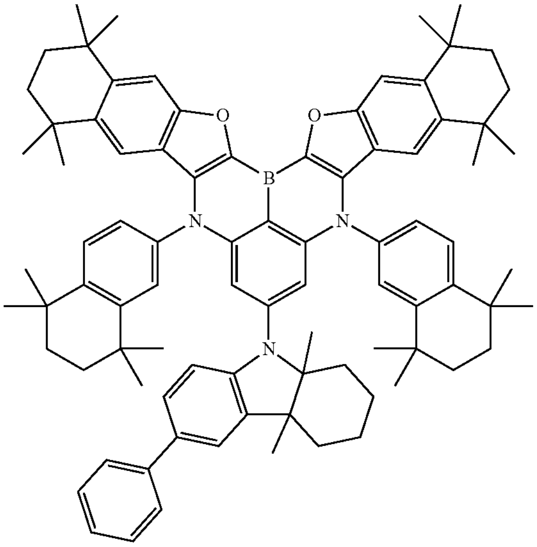
-continued
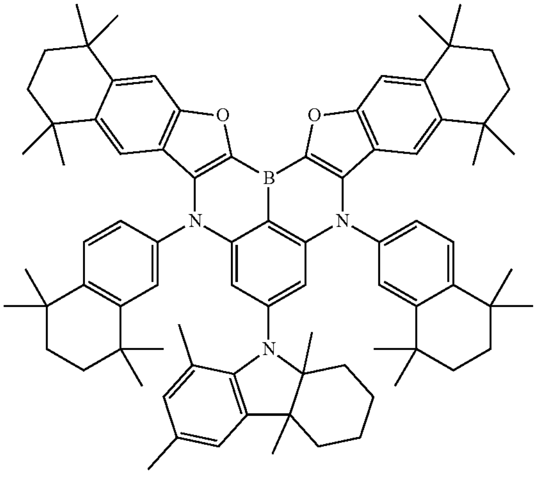
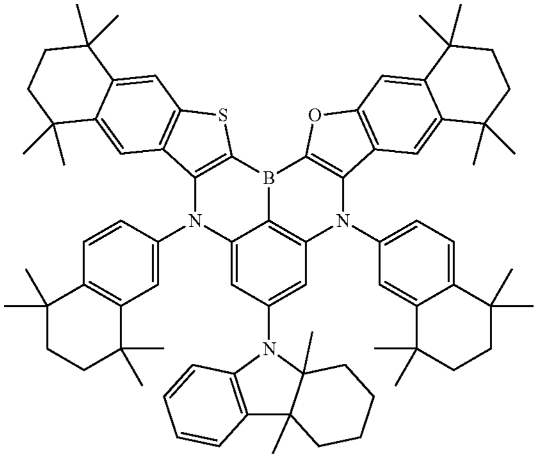
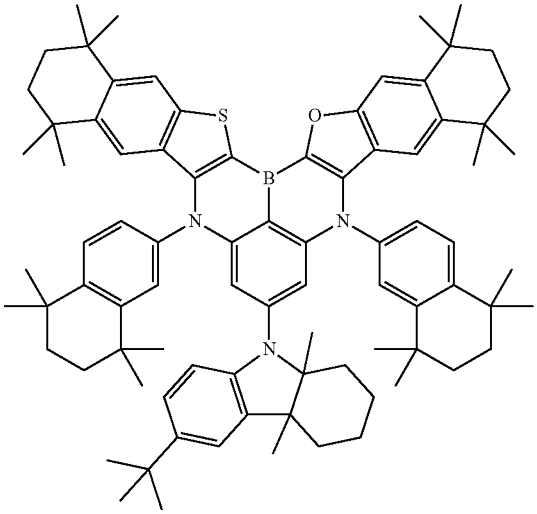
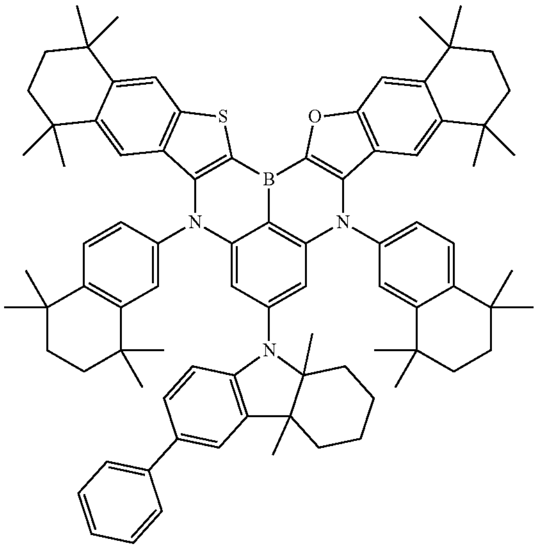

-continued
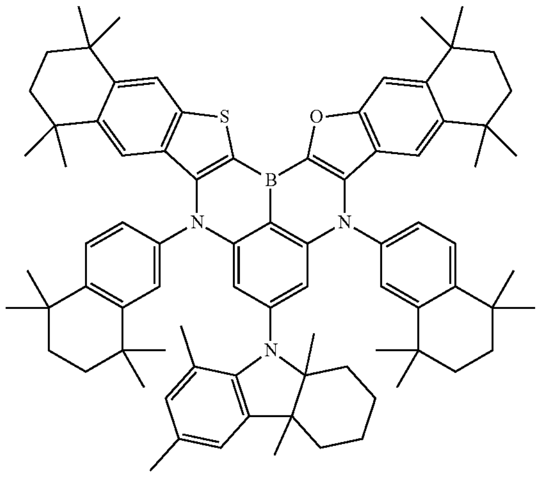
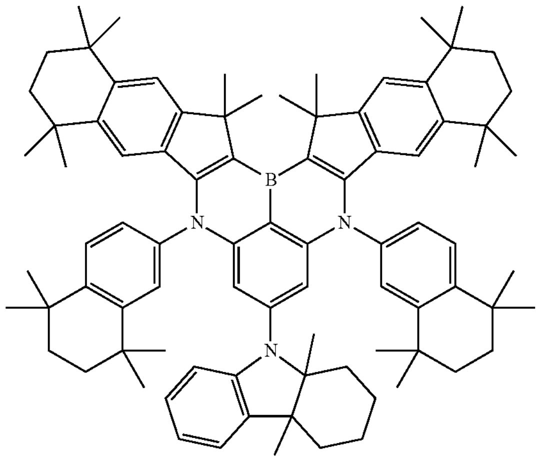
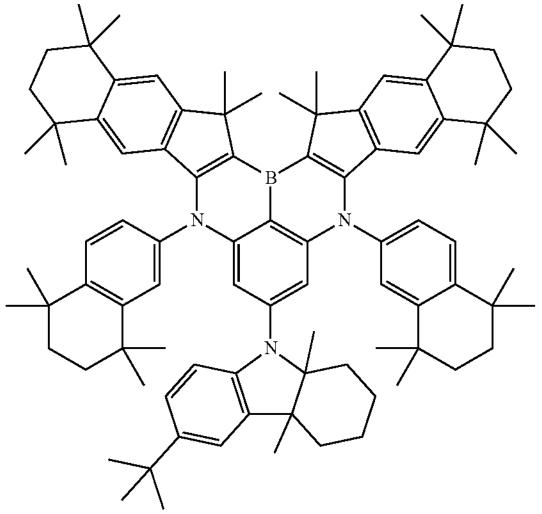
-continued
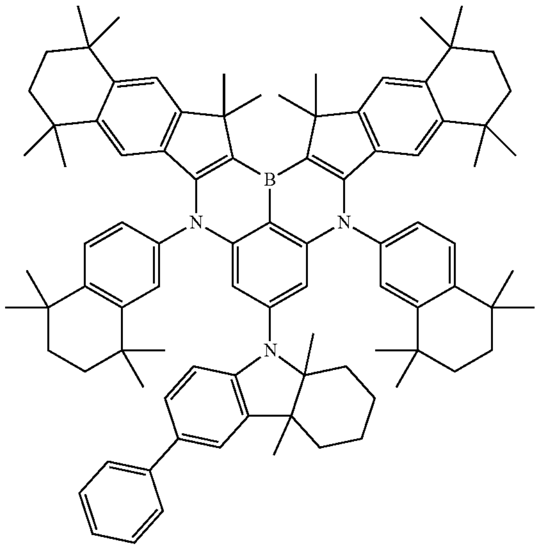
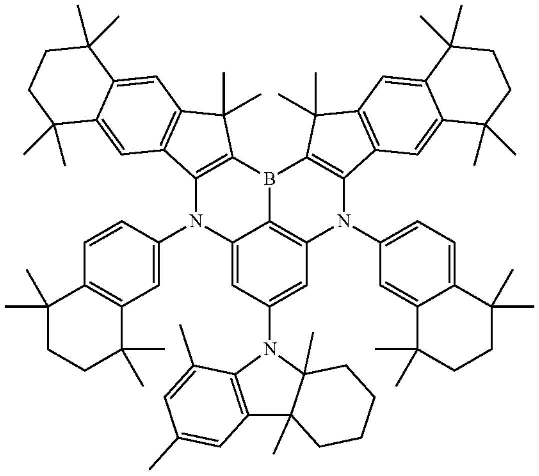
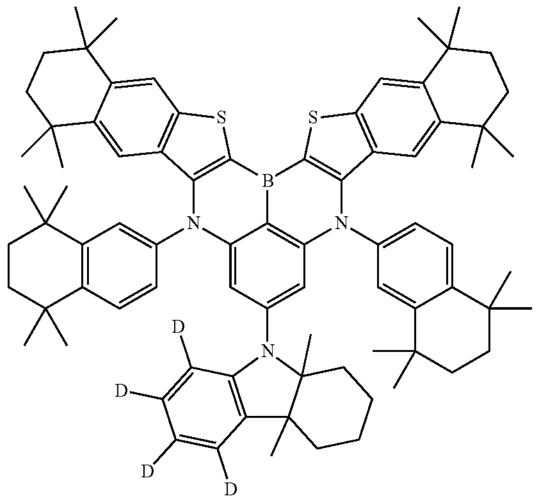

-continued
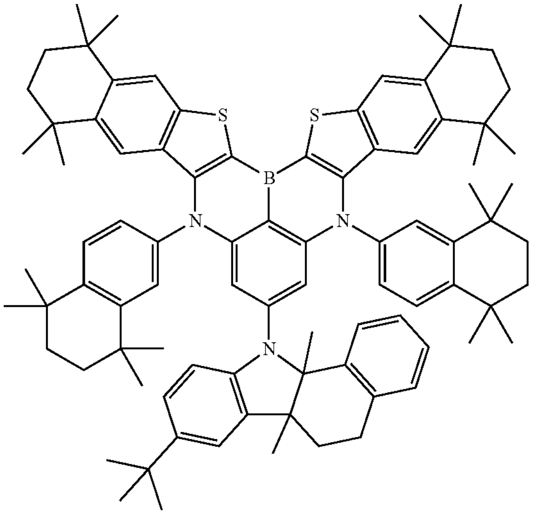
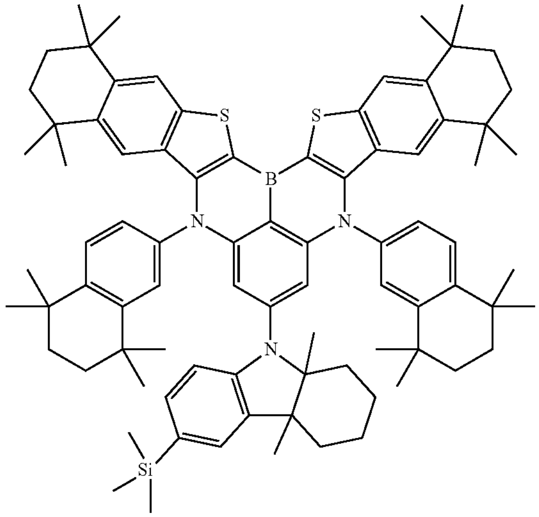
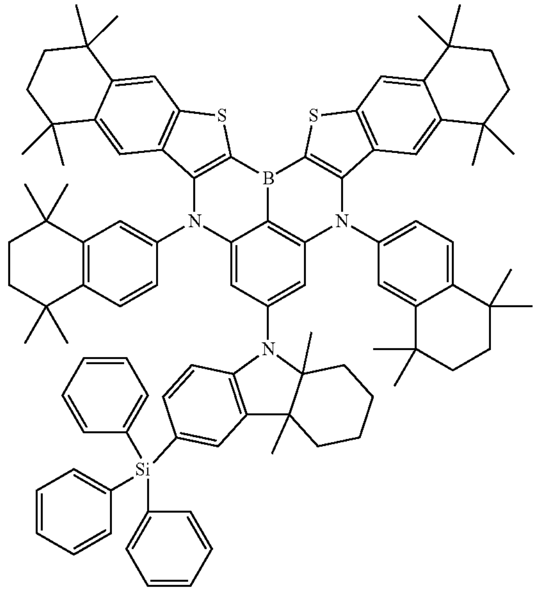
-continued
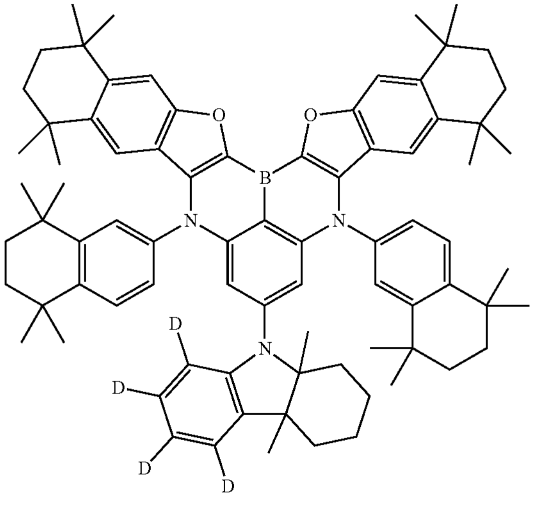
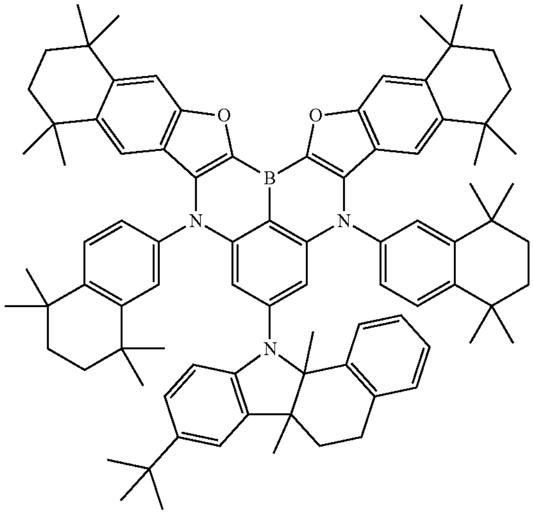
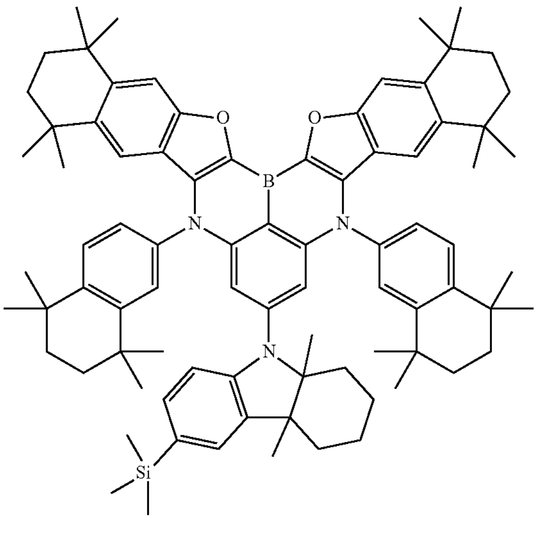

-continued
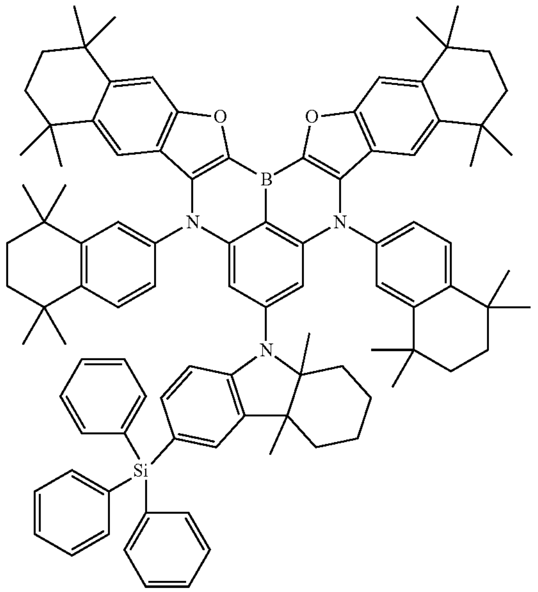
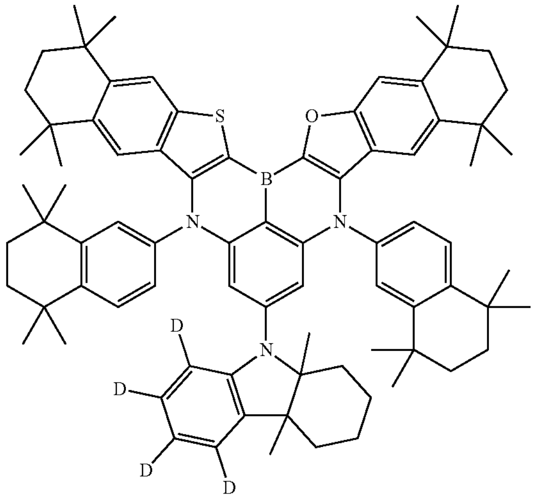
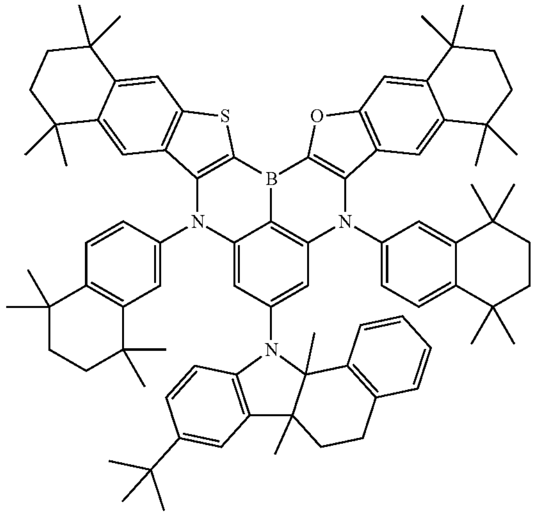
-continued
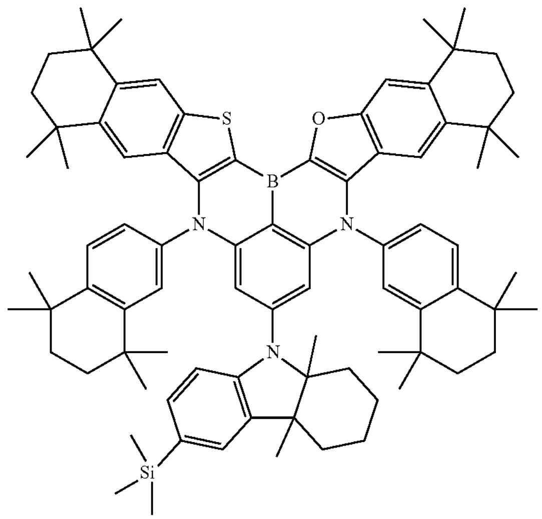
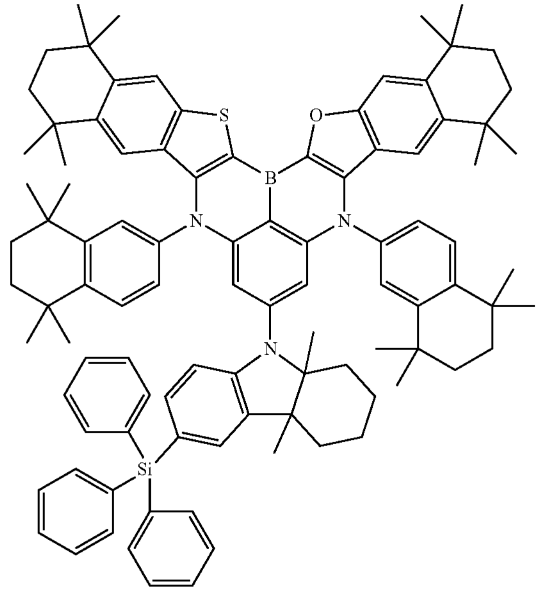
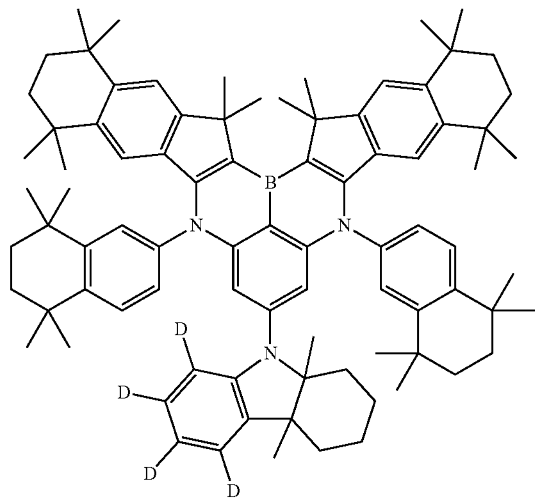

-continued
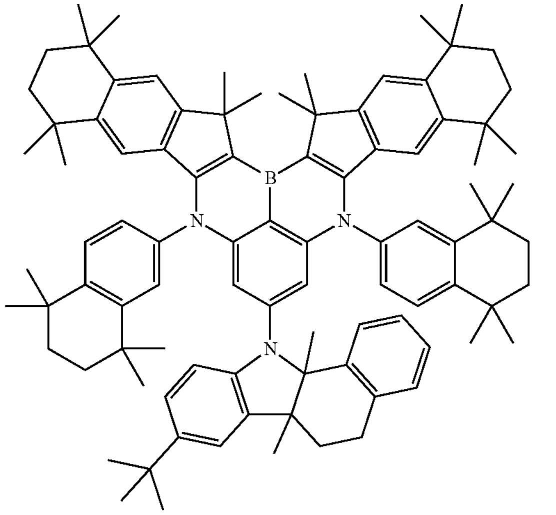
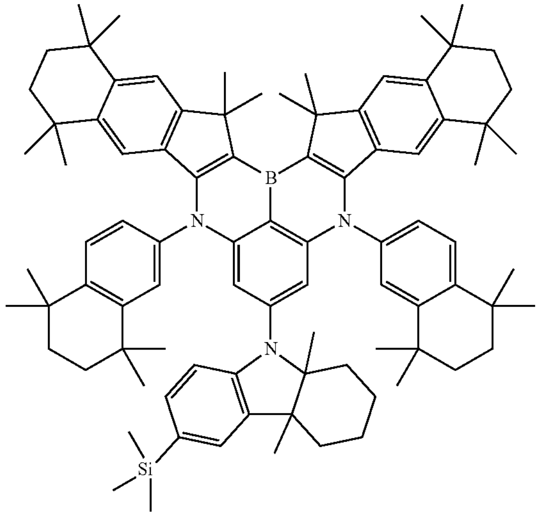
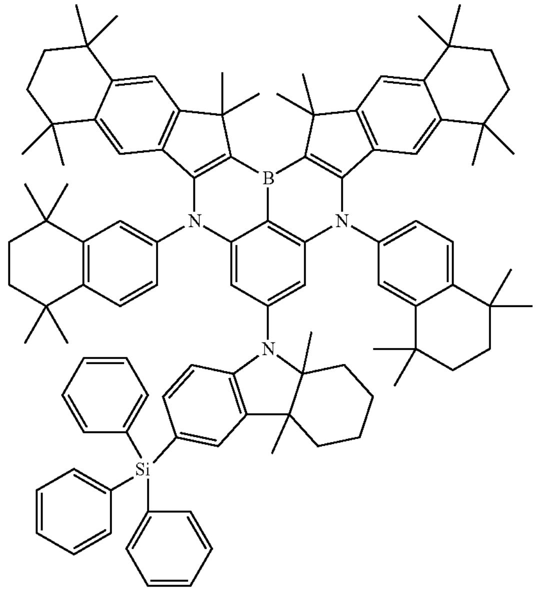
-continued
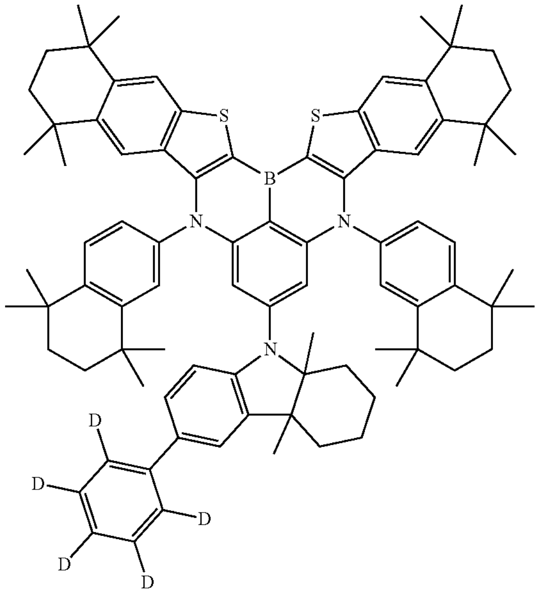
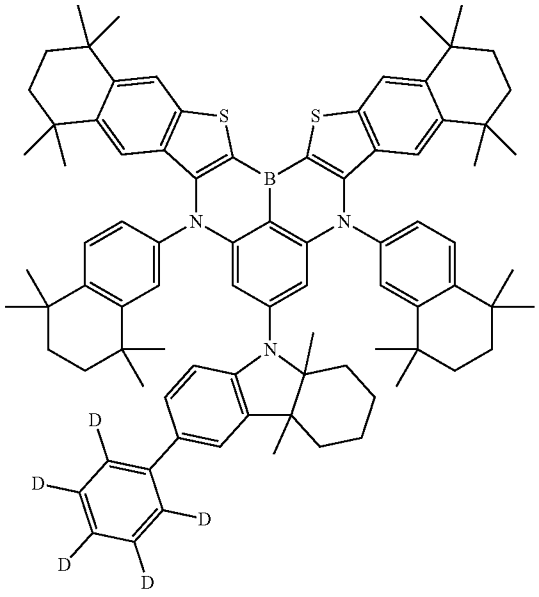

-continued
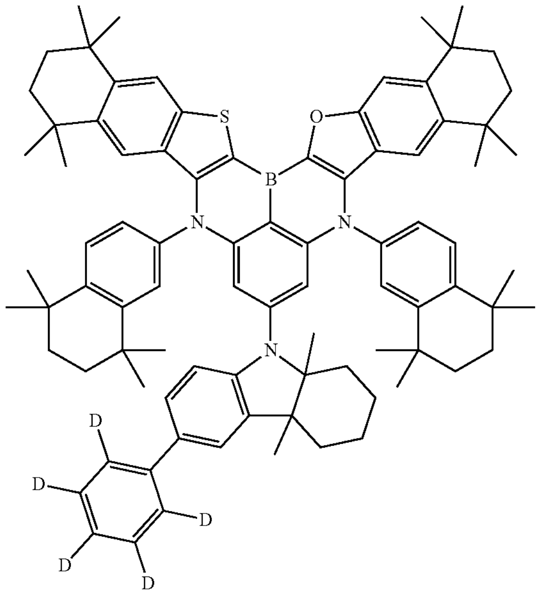
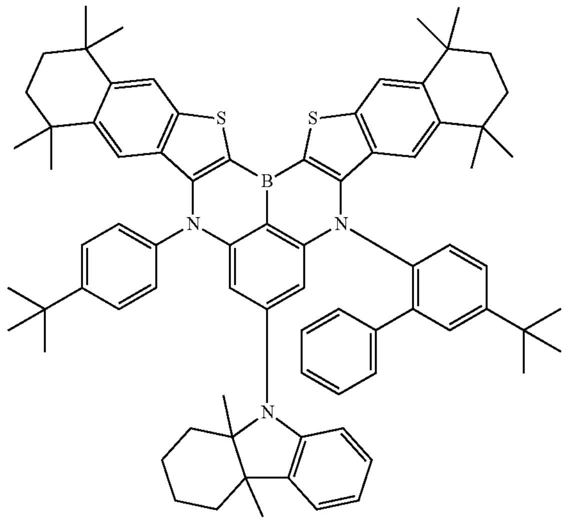
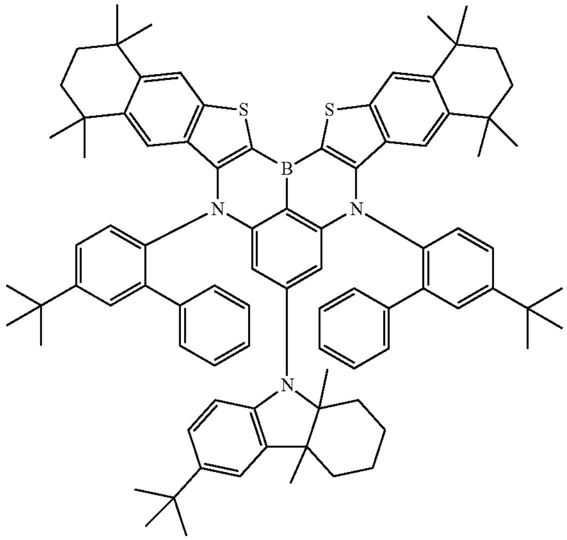
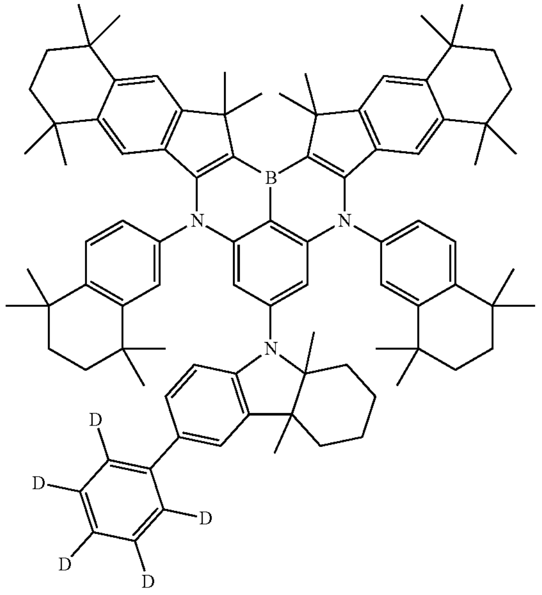
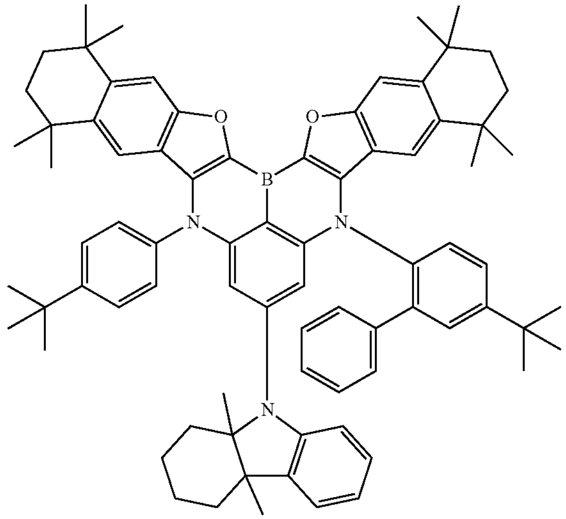

-continued
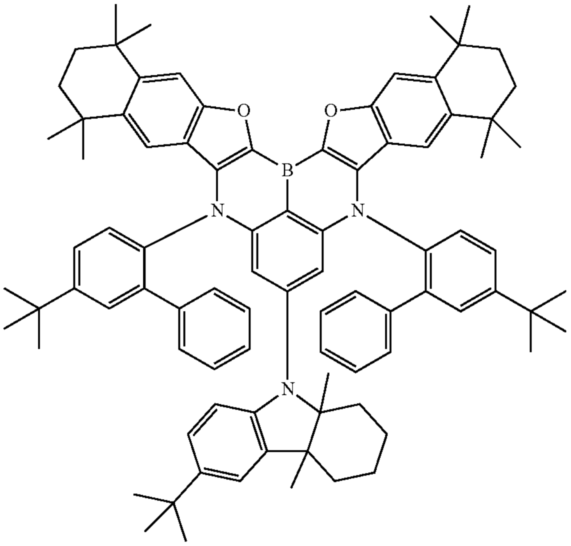
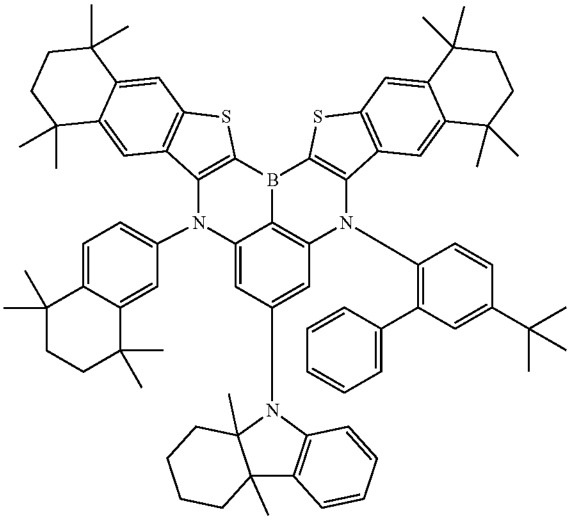
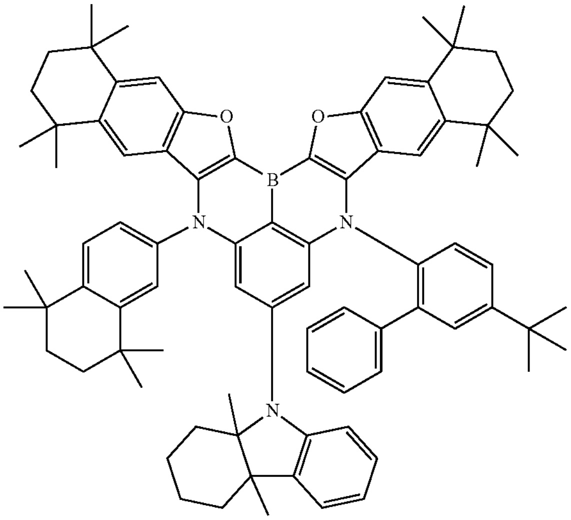
-continued
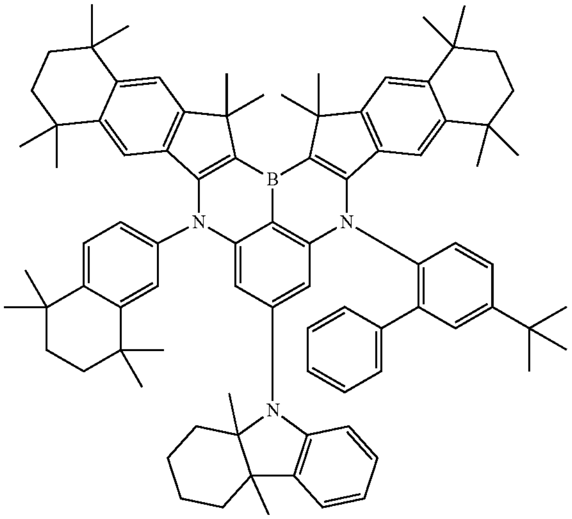
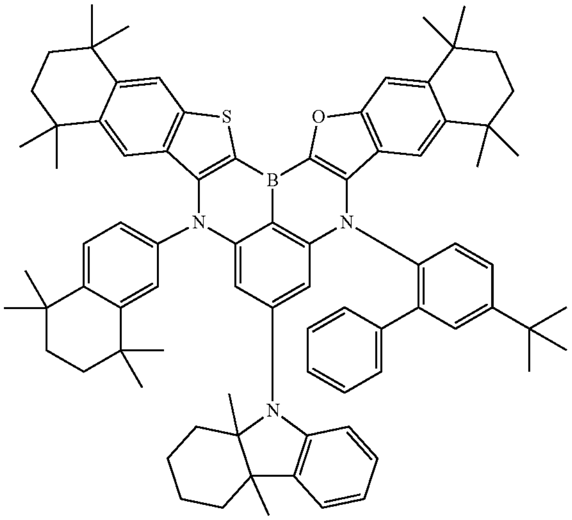
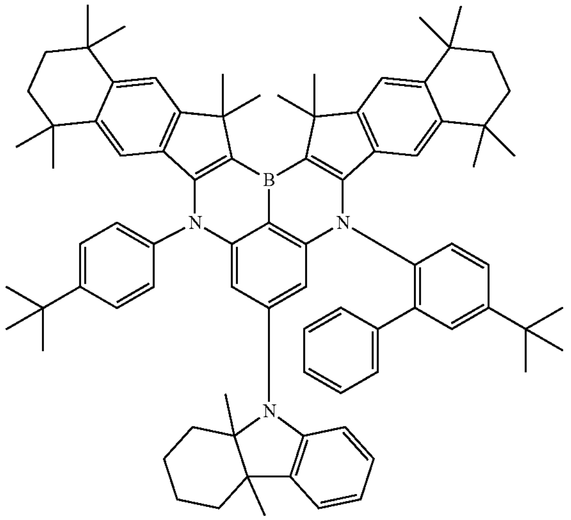

-continued
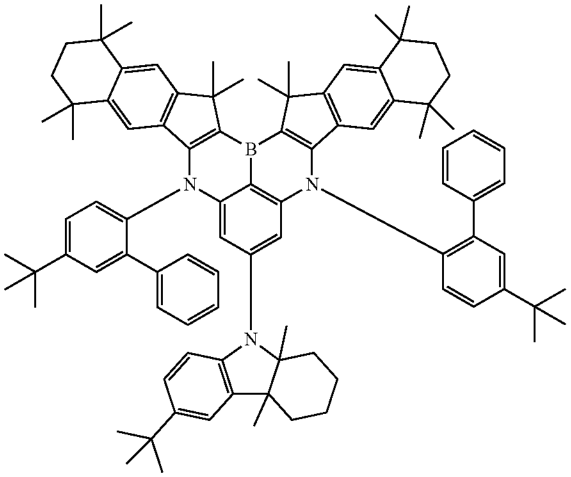
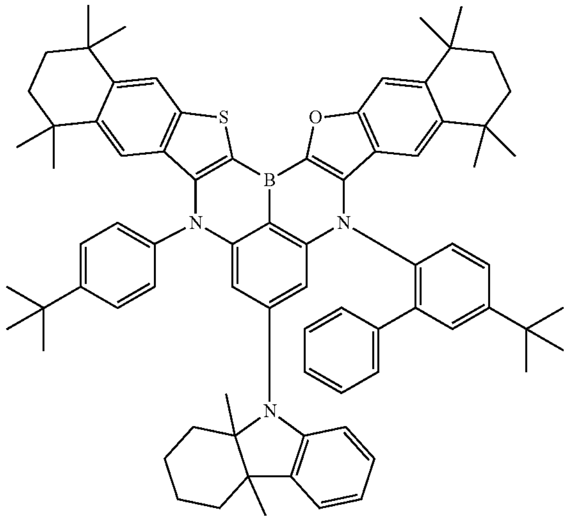
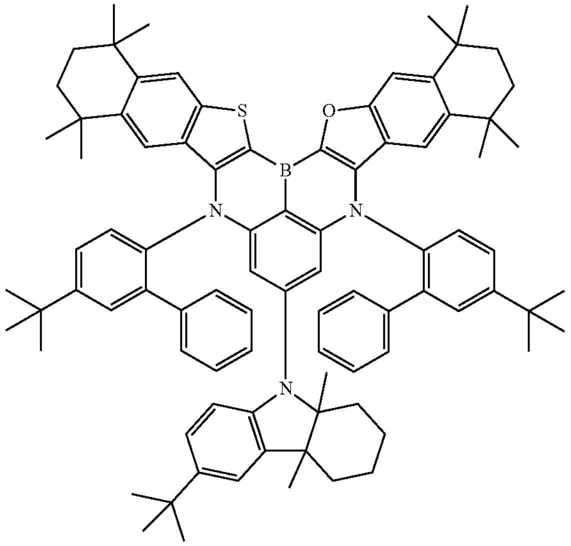
-continued
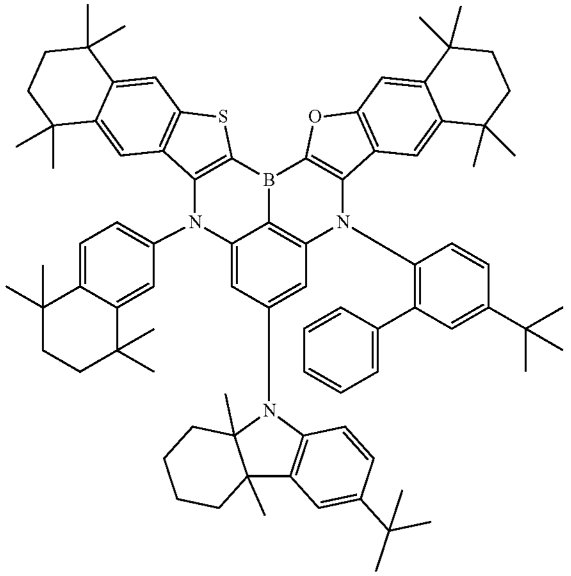
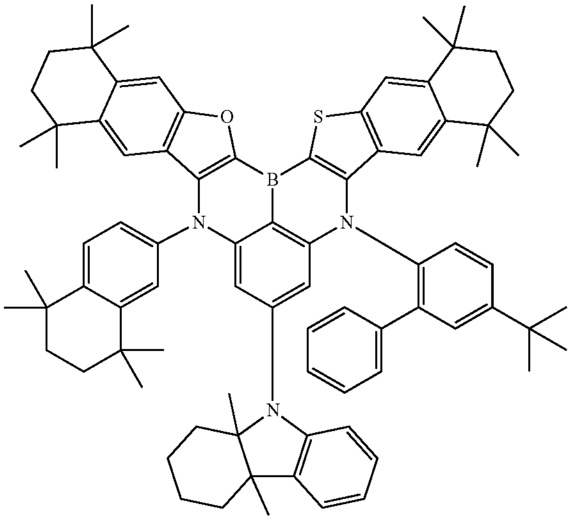
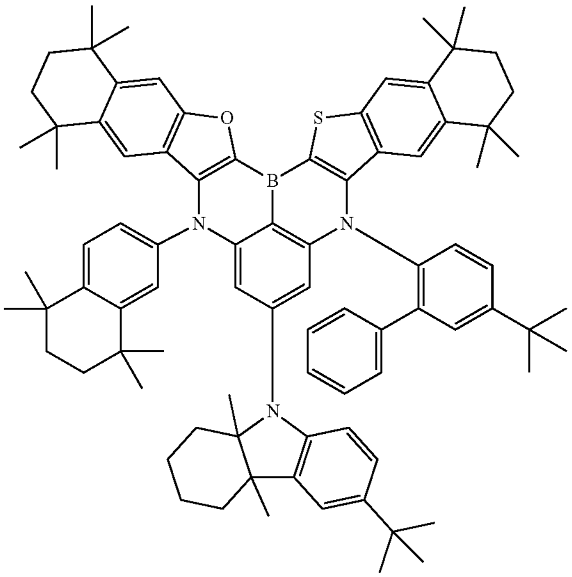

-continued
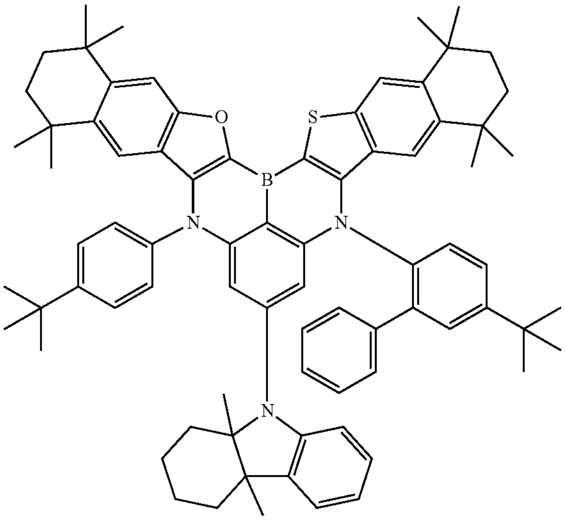
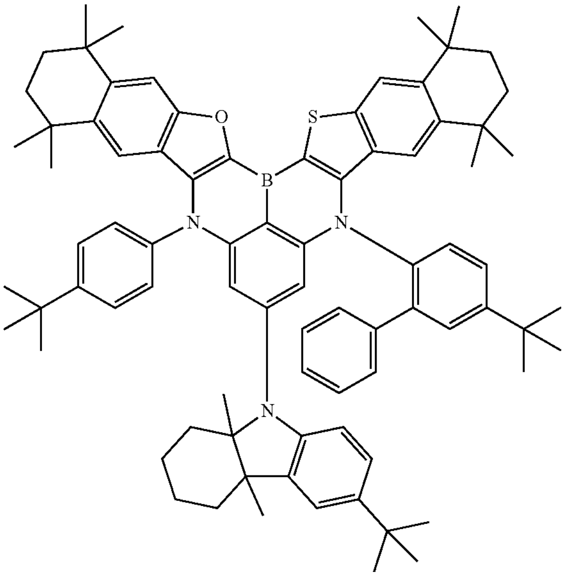
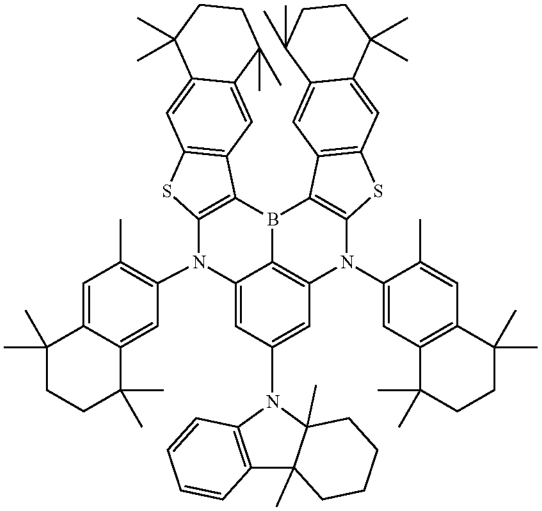
-continued
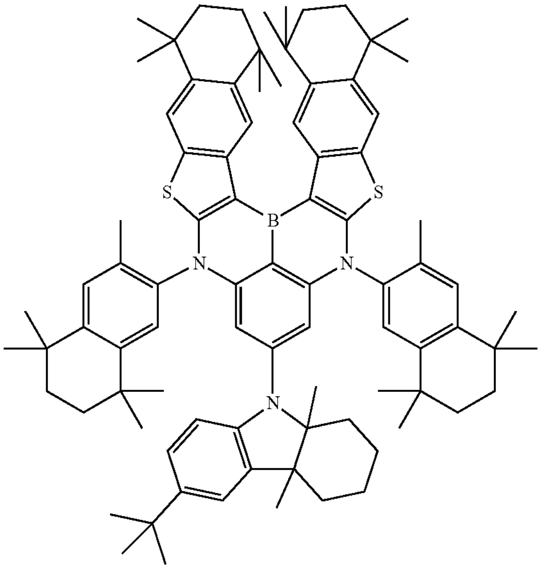
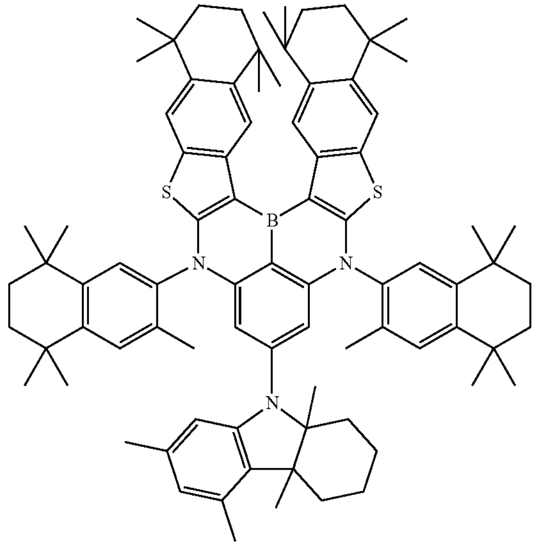
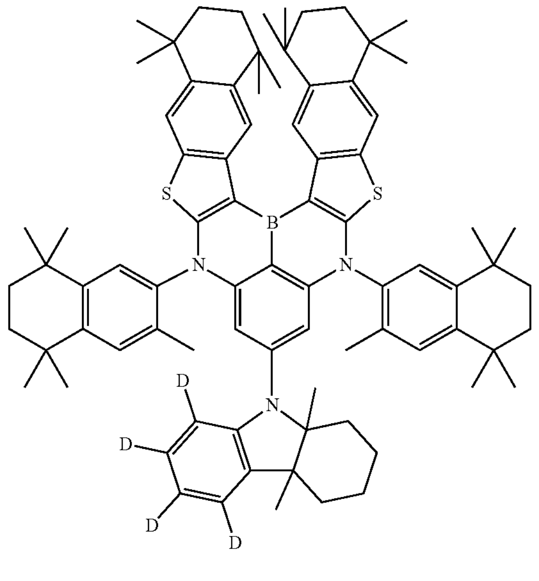

-continued
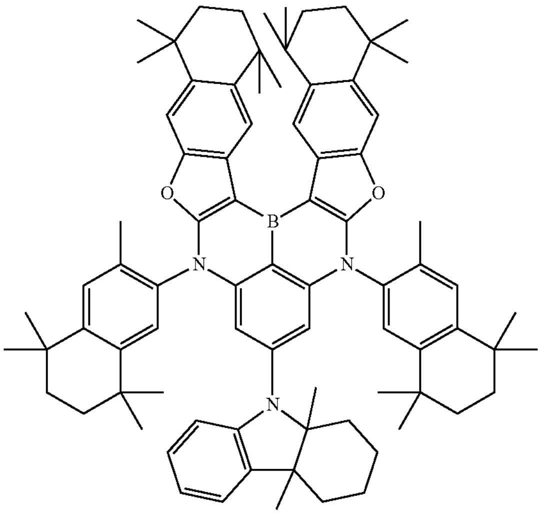
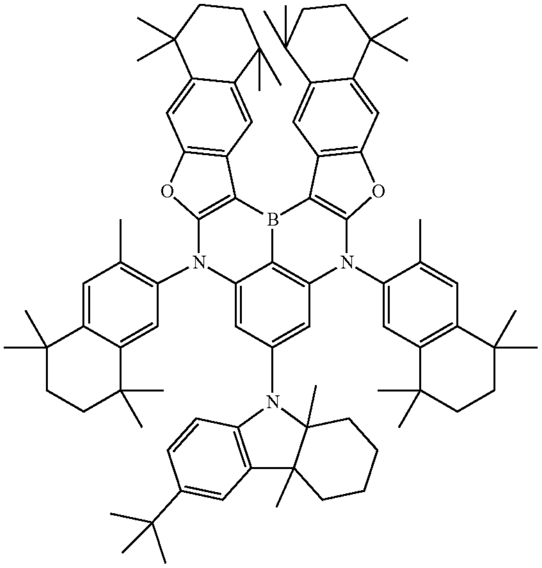
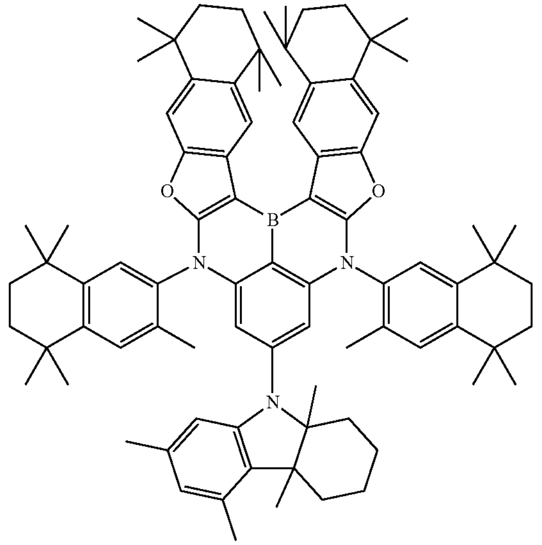
-continued
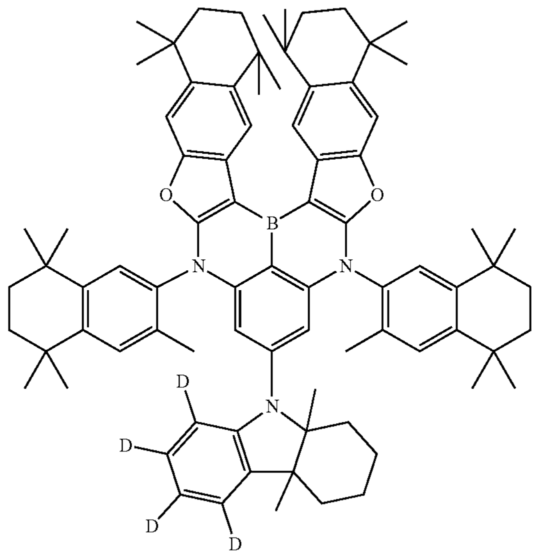
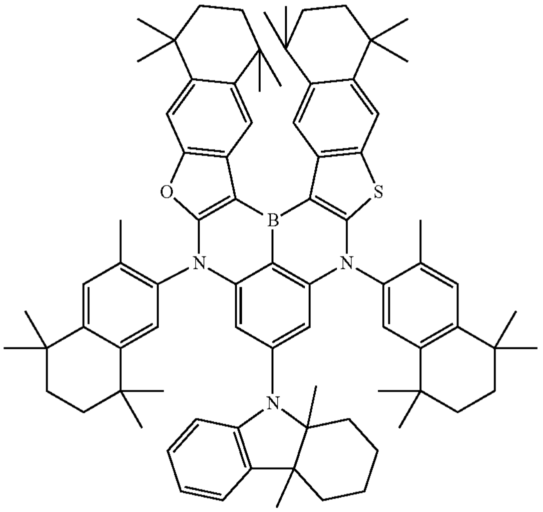
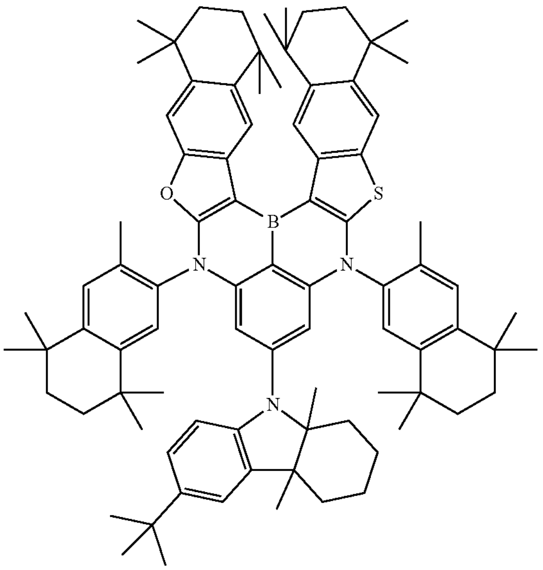

-continued
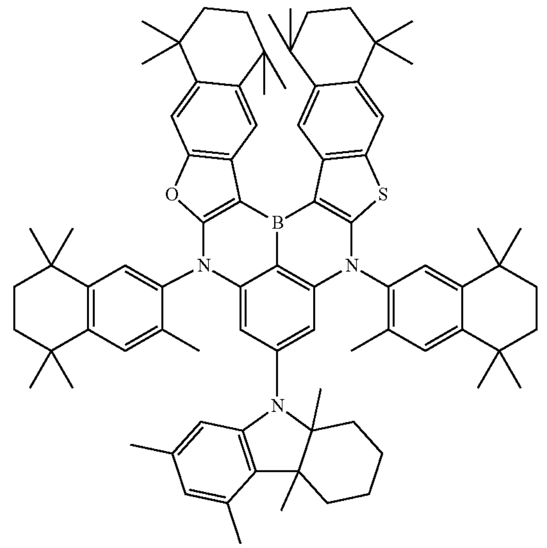
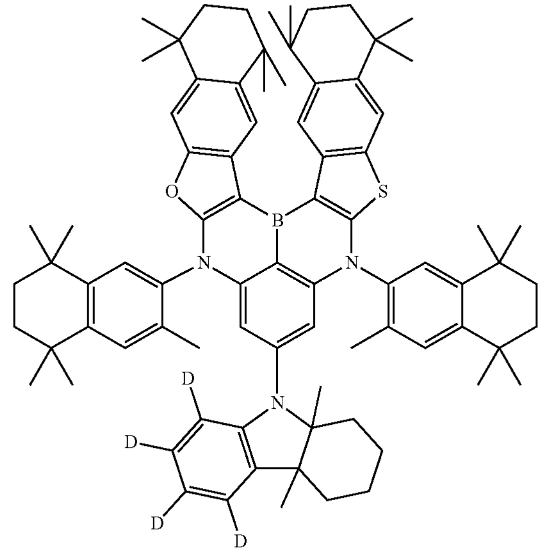
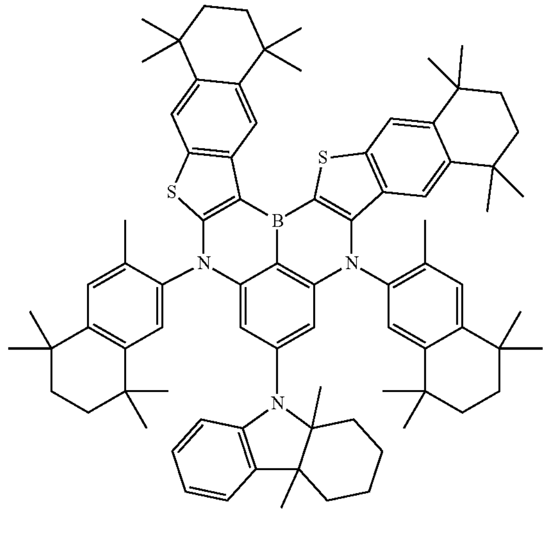
-continued
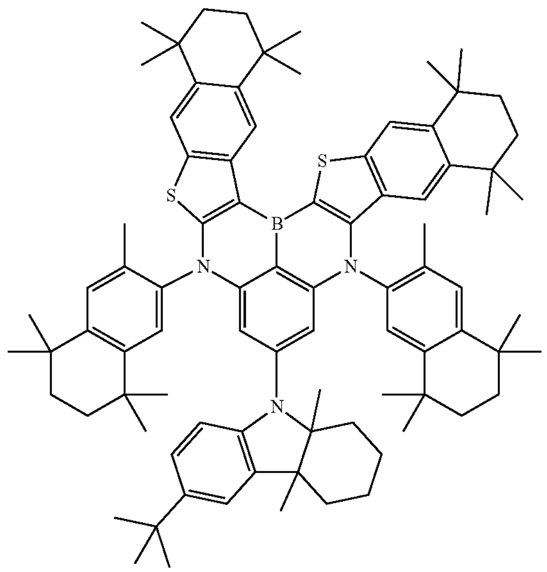
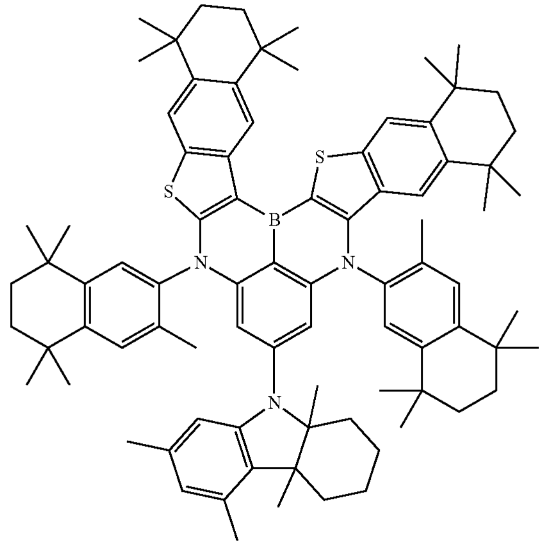
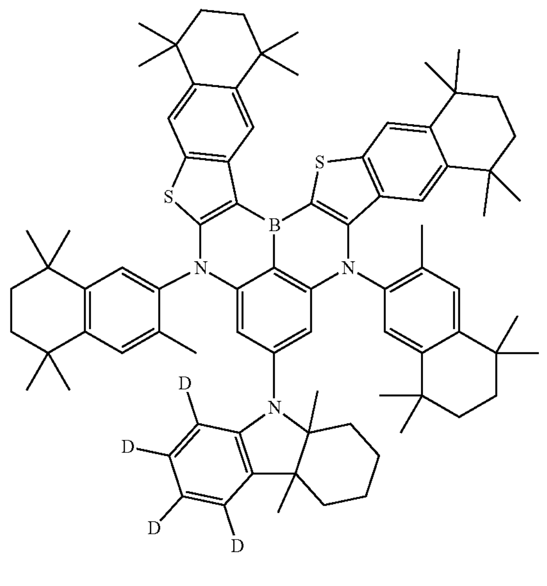

-continued
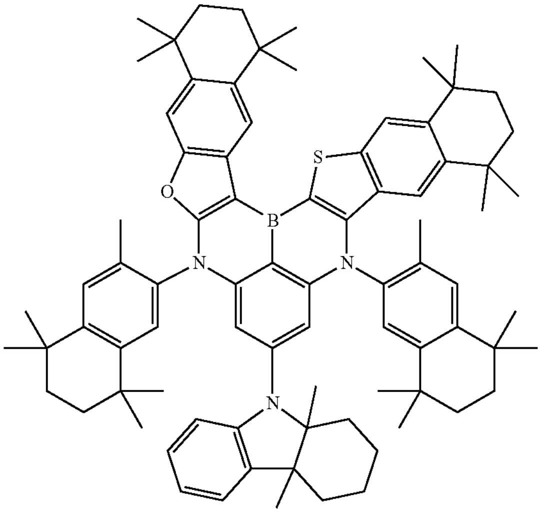
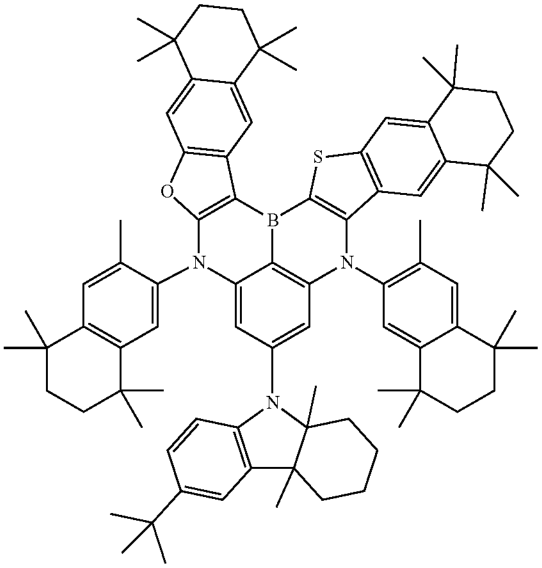
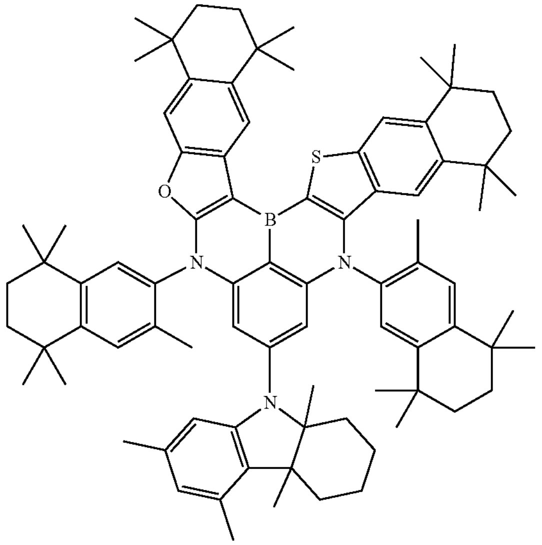
-continued
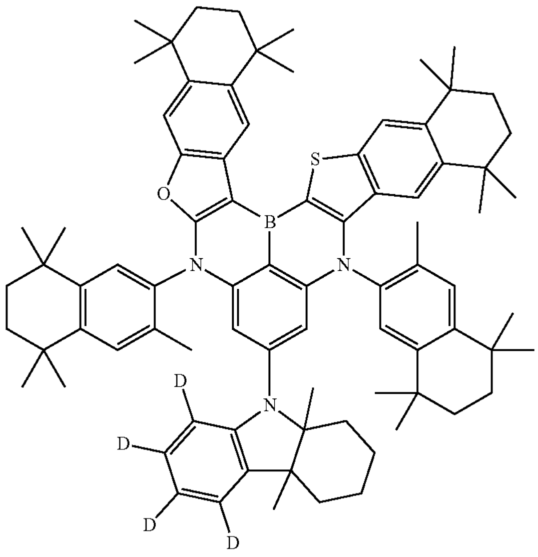 [SMILES: [2H]c1c([2H])c([2H])c2c(c1[2H])N(c1cc3c4c(c1)N(c1cc5c(cc1C)C(C)(C)CCC5(C)C)c1c(sc5cc6c(cc15)C(C)(C)CCC6(C)C)B4c1c(oc4cc5c(cc14)C(C)(C)CCC5(C)C)N3c1cc3c(cc1C)C(C)(C)CCC3(C)C)C1(C)CCCCC21C]
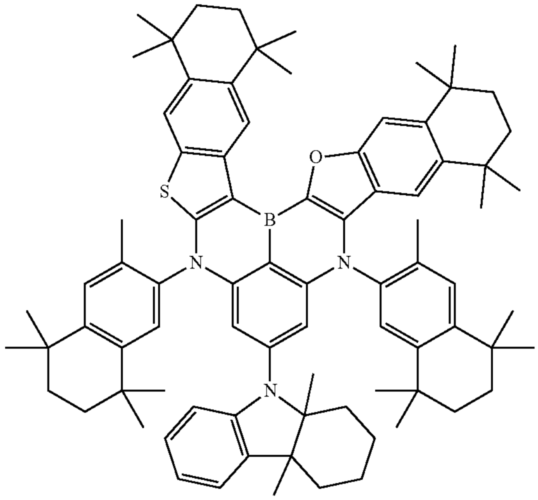
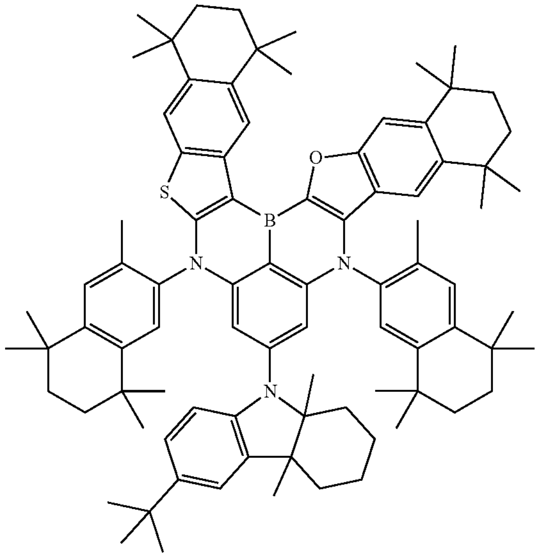

-continued
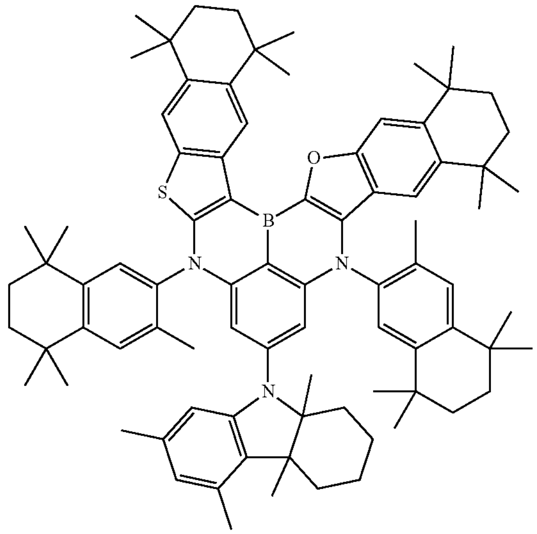
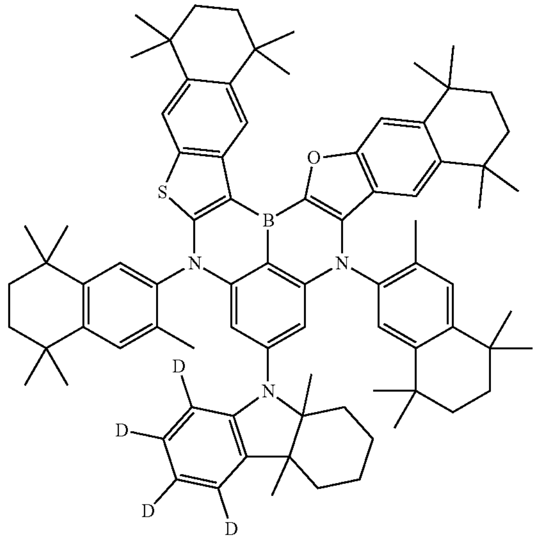
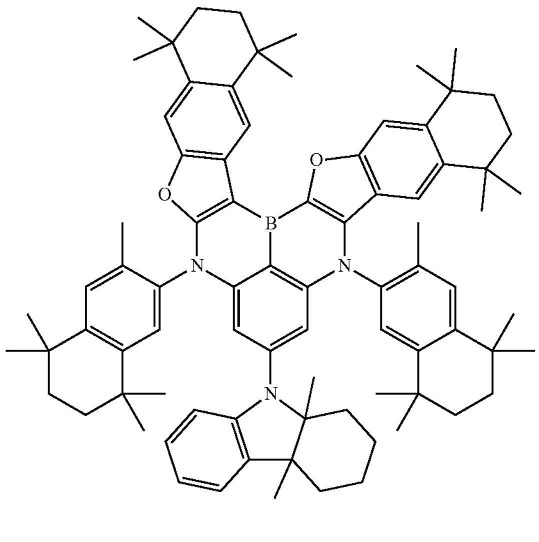
-continued
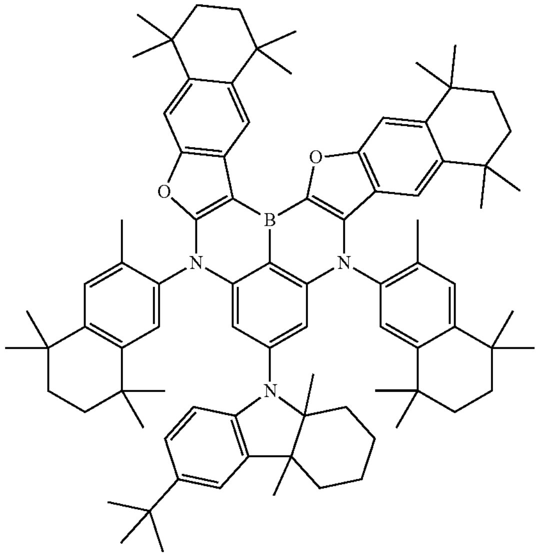
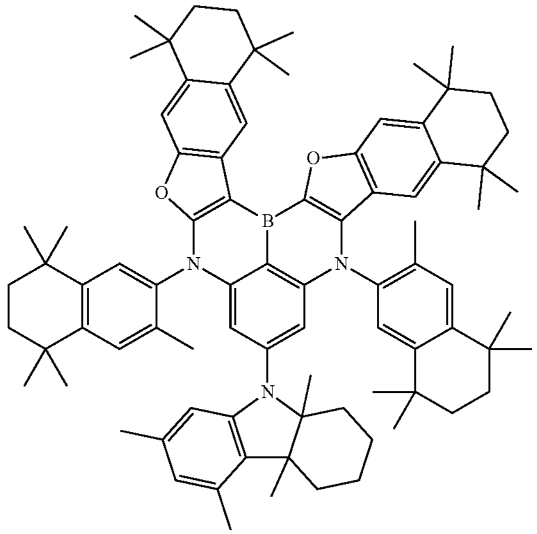
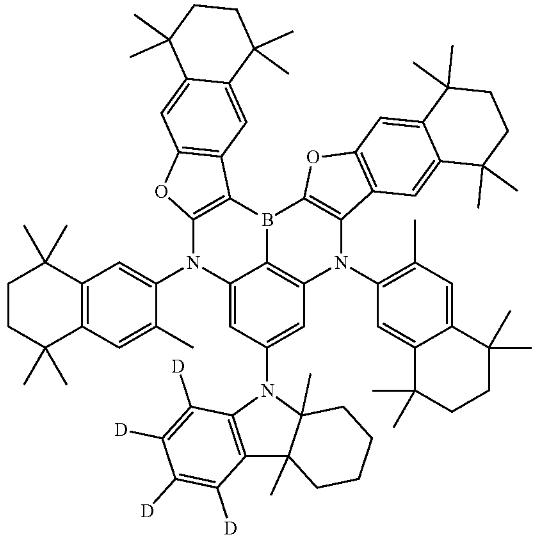

-continued
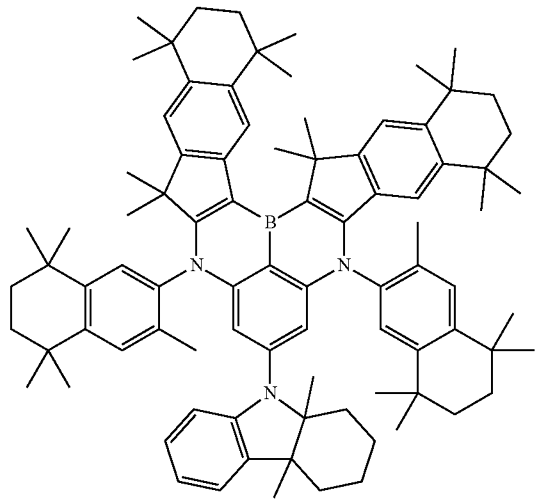
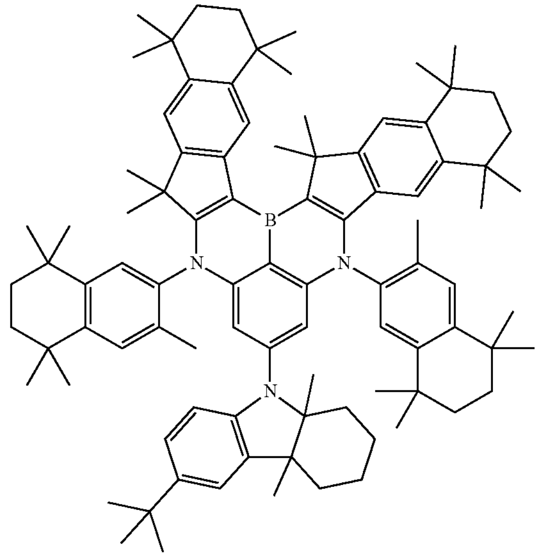
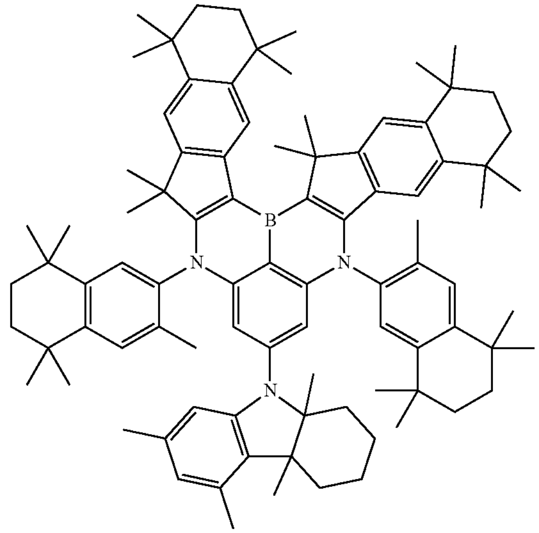
-continued
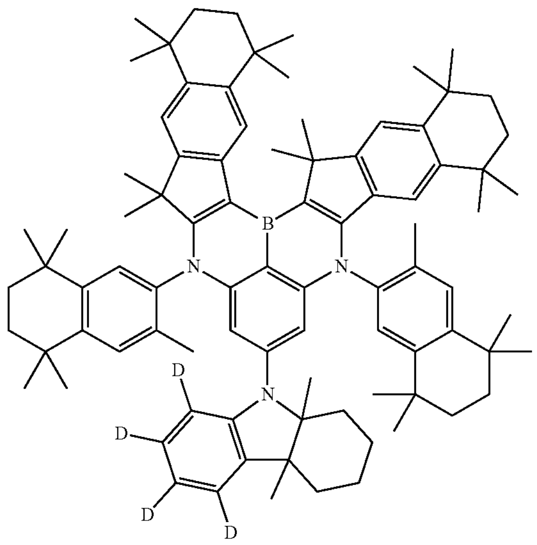
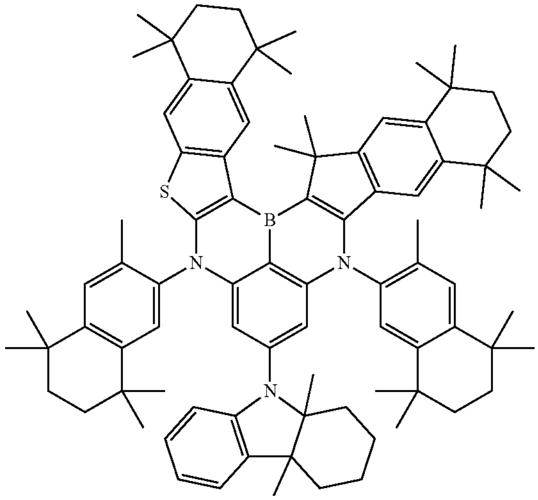
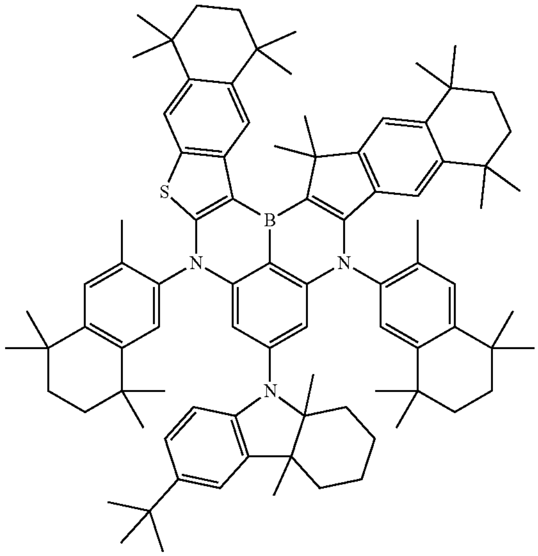

-continued
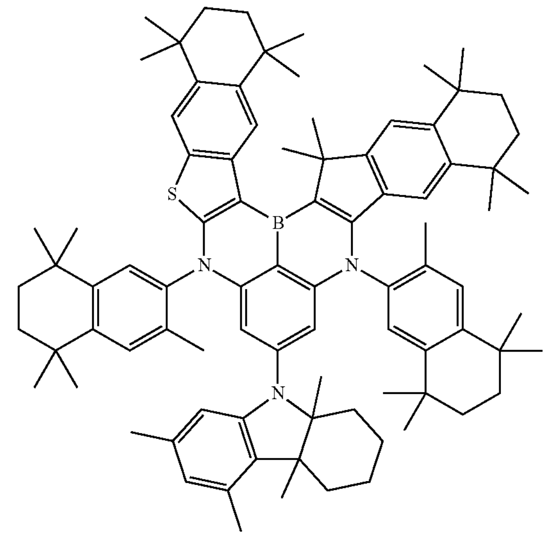
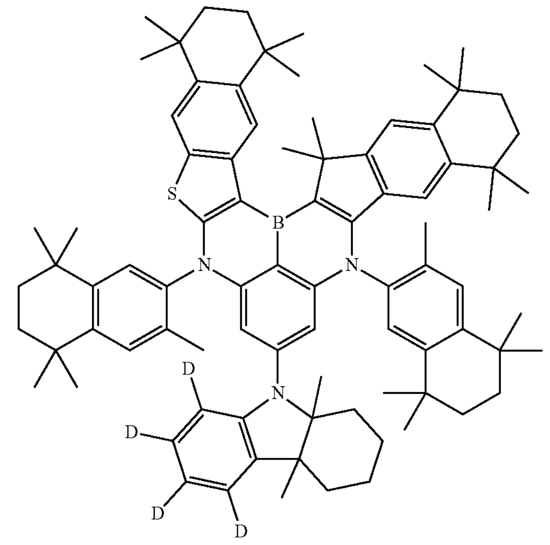
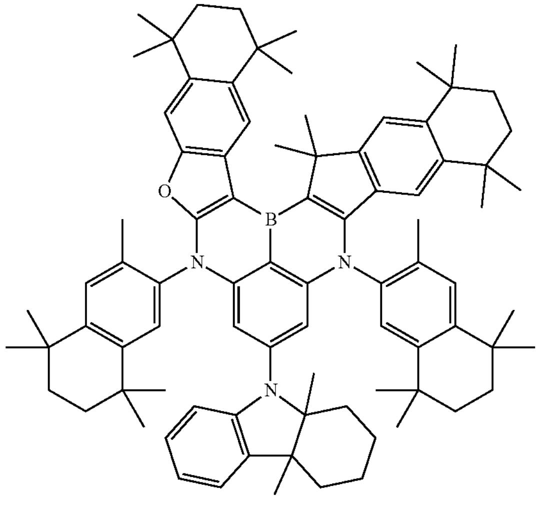
-continued
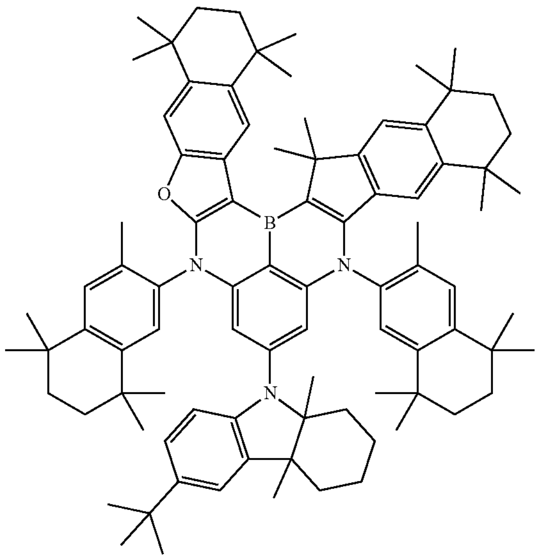
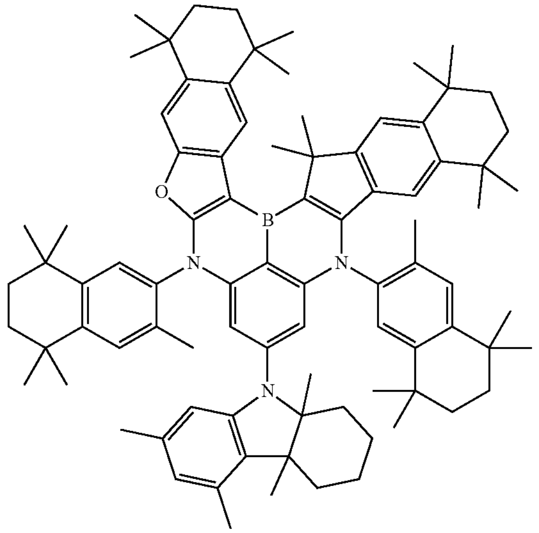
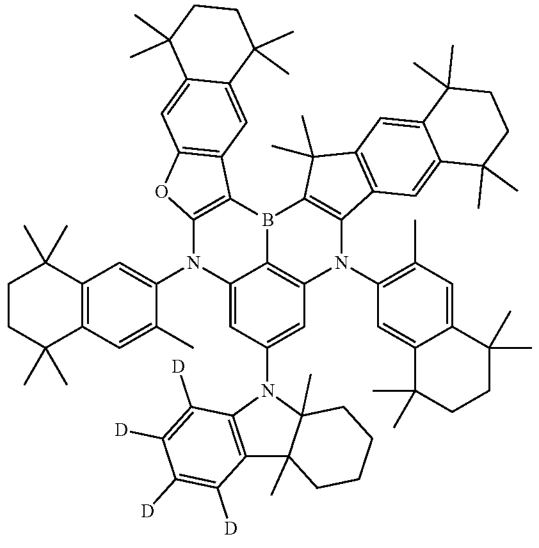

-continued
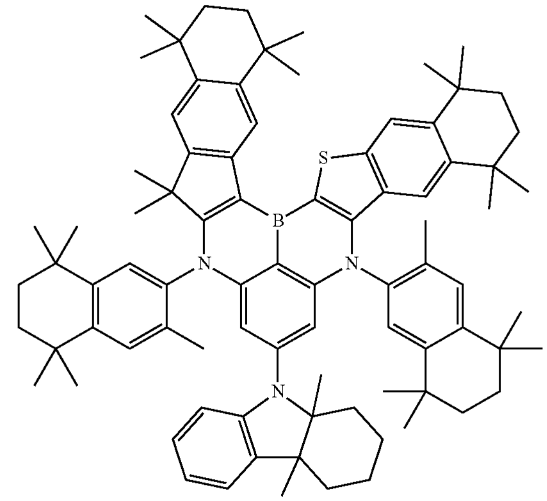
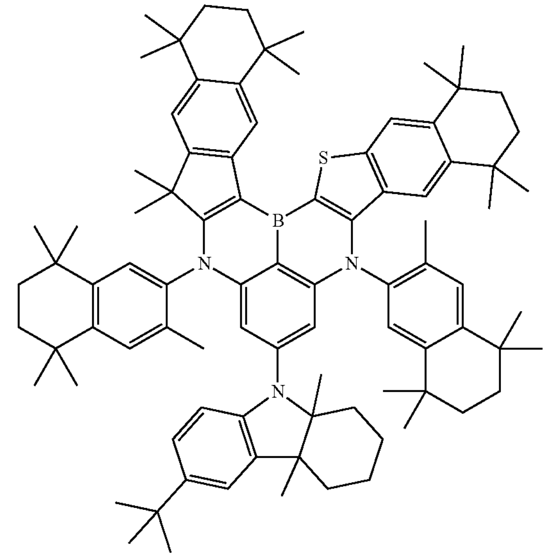
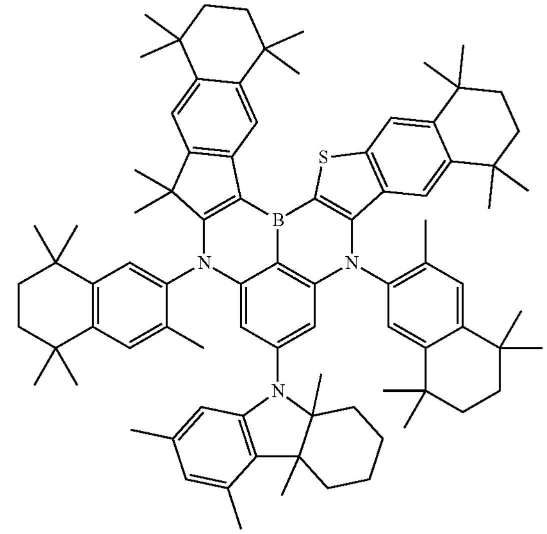
-continued
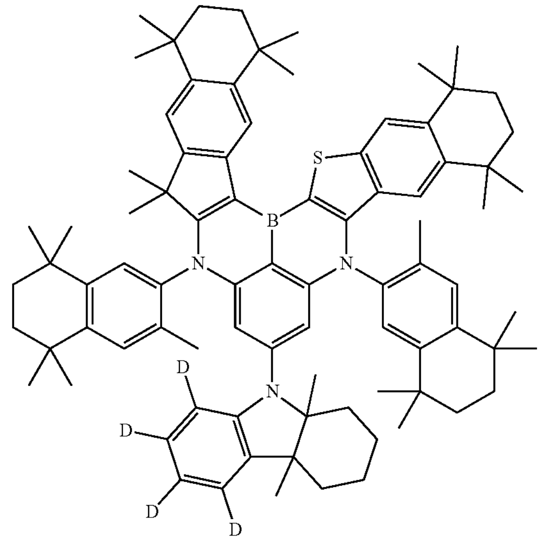 [SMILES: [2H]c1c([2H])c([2H])c2c(c1[2H])N(c1cc3c4c(c1)N(c1cc5c(cc1C)C(C)(C)CCC5(C)C)c1c(oc5cc6c(cc15)C(C)(C)CCC6(C)C)B4C1=C(N3c3cc4c(cc3C)C(C)(C)CCC4(C)C)C(C)(C)c3cc4c(cc31)C(C)(C)CCC4(C)C)C1(C)CCCCC21C]
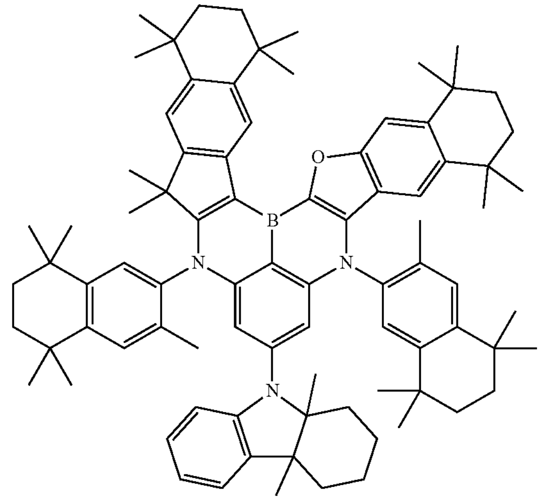
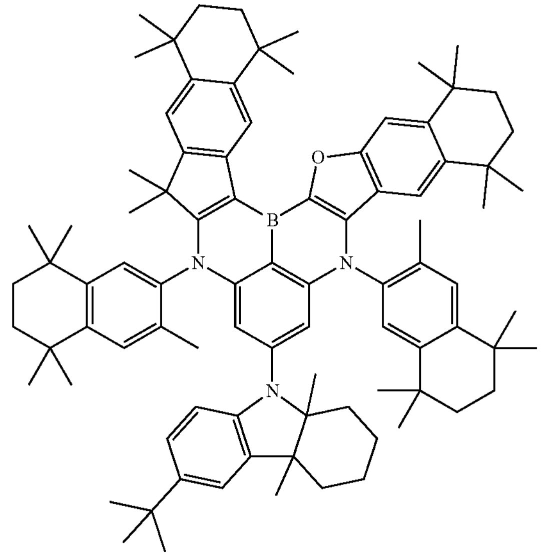

-continued
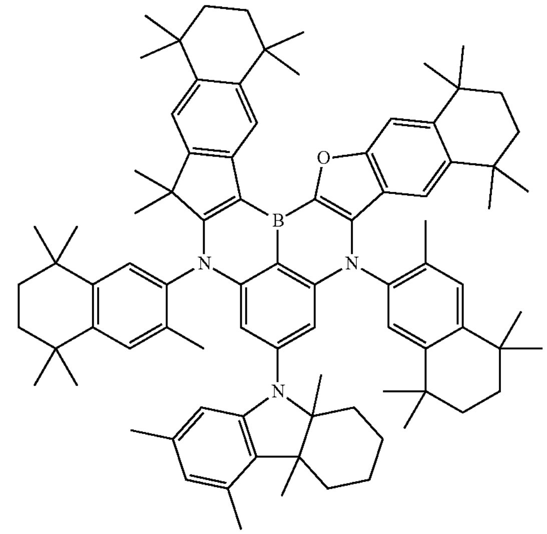
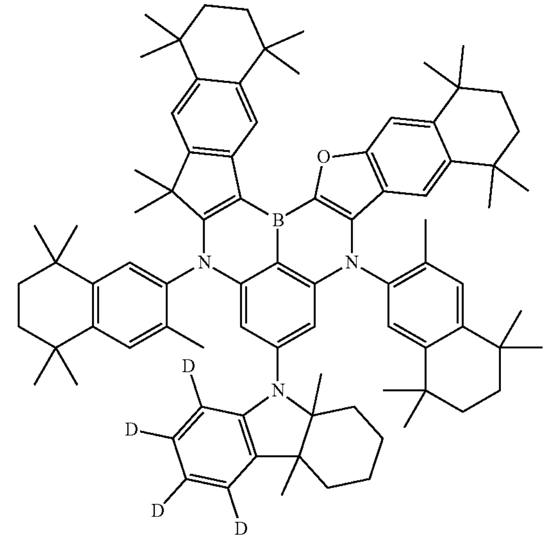
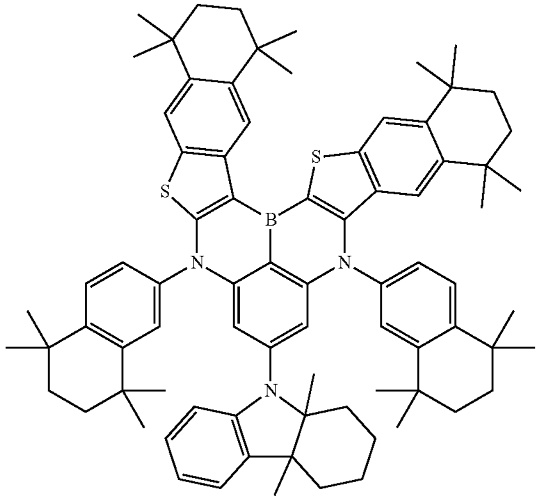
-continued
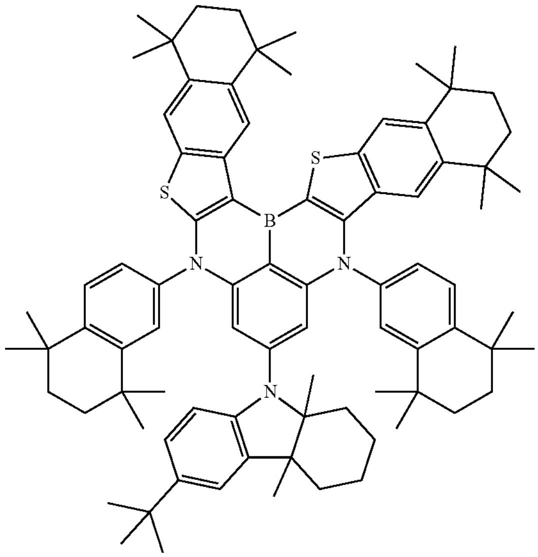
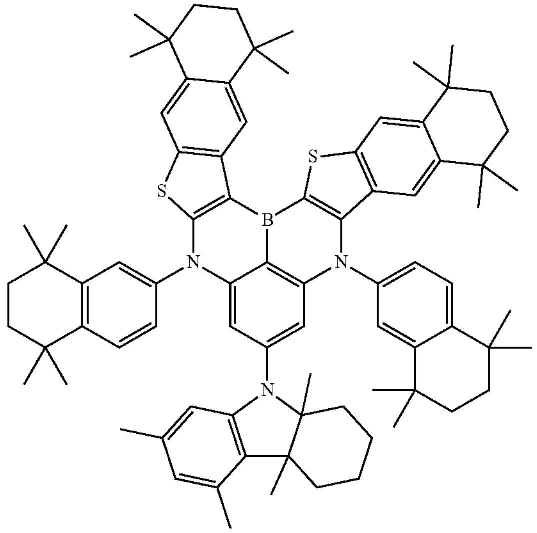
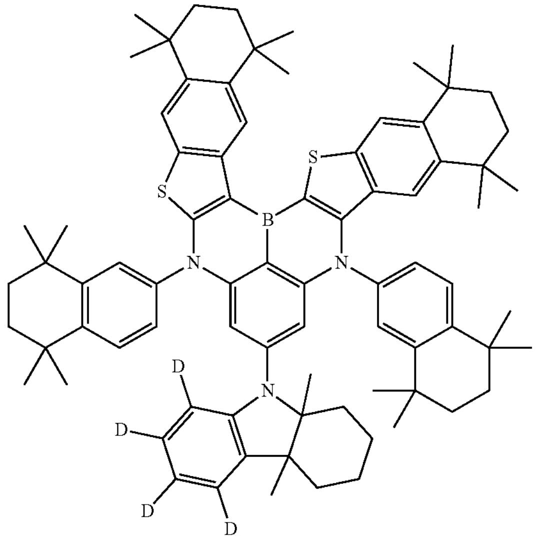

-continued
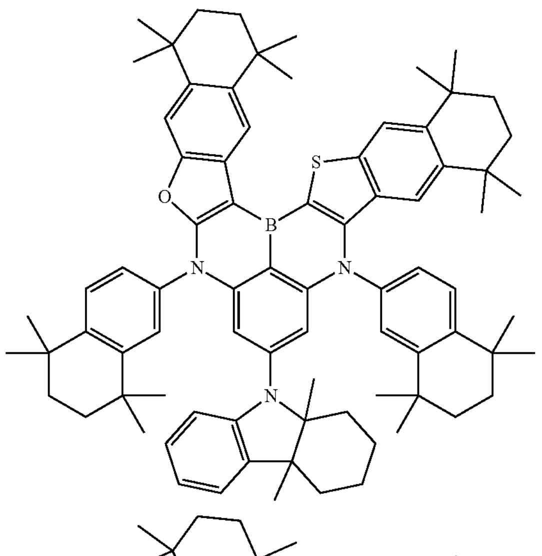
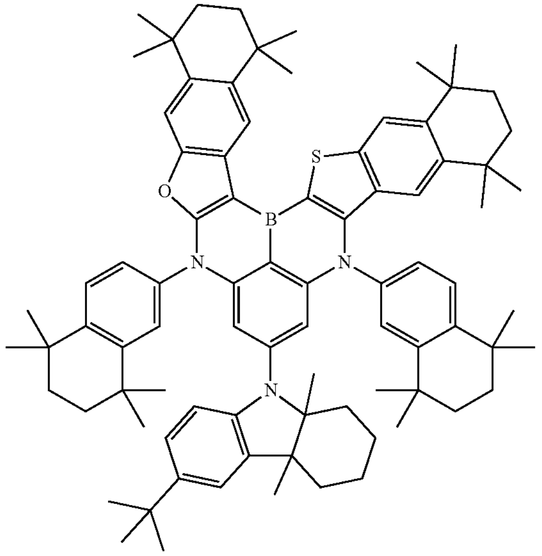
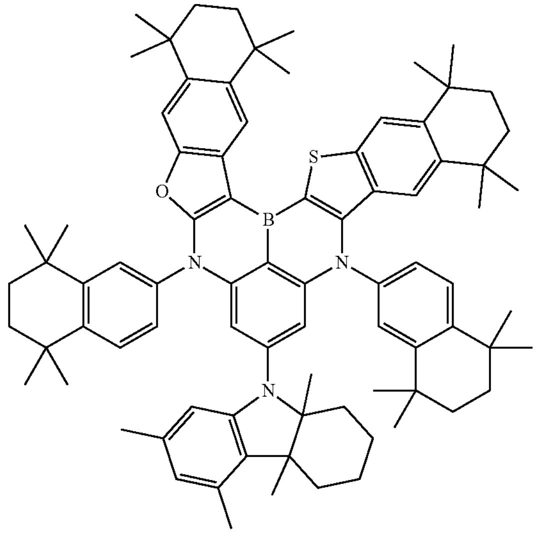
-continued
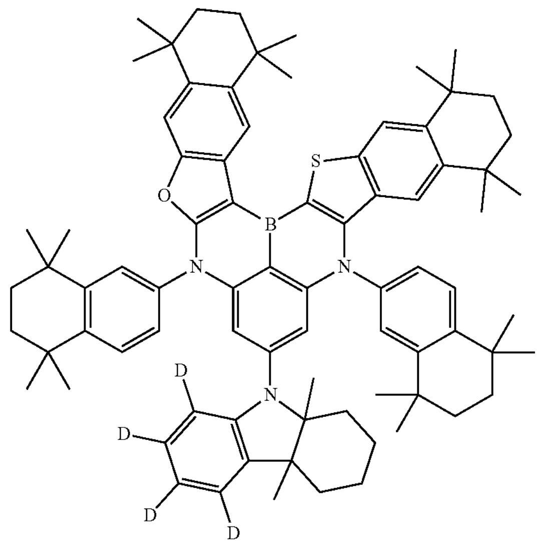
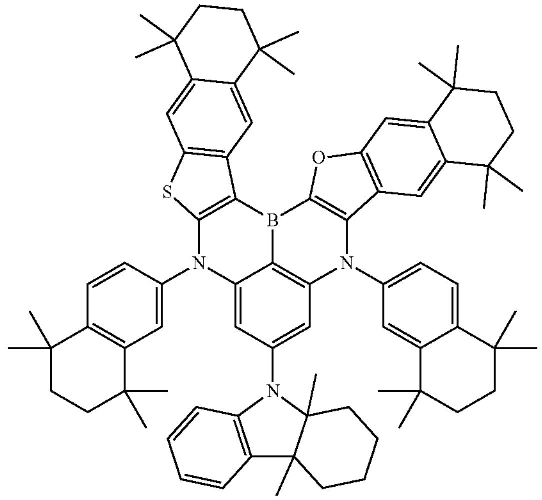
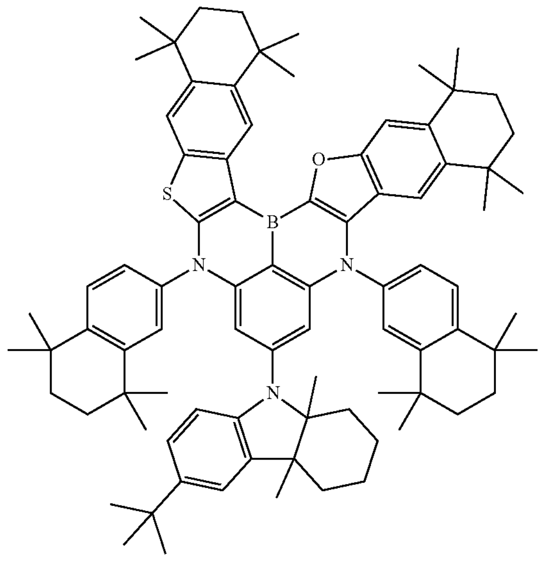

-continued
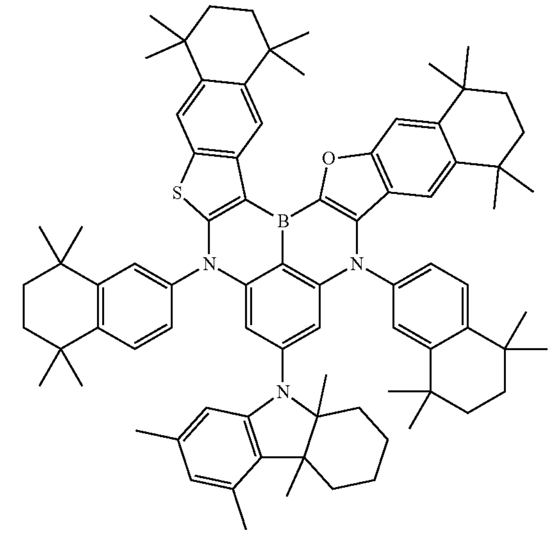
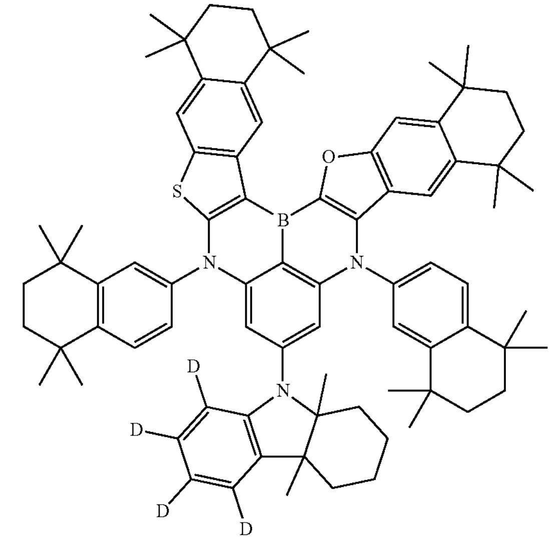
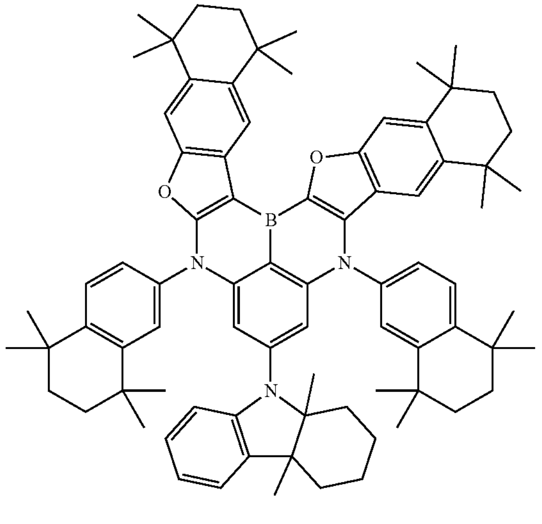
-continued
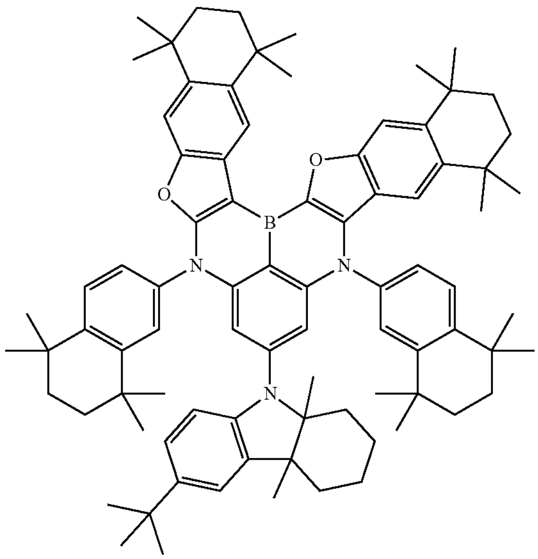
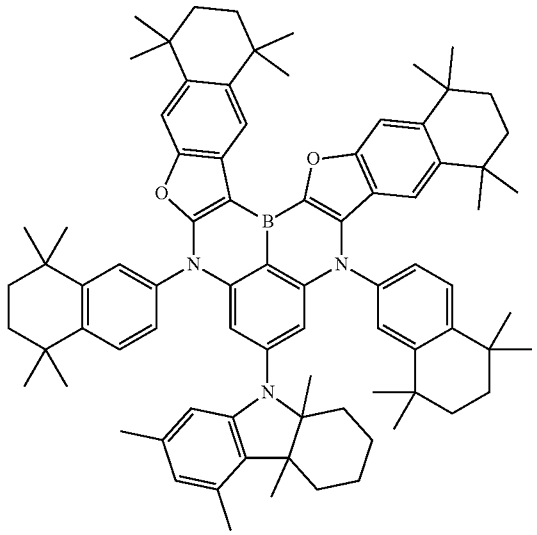
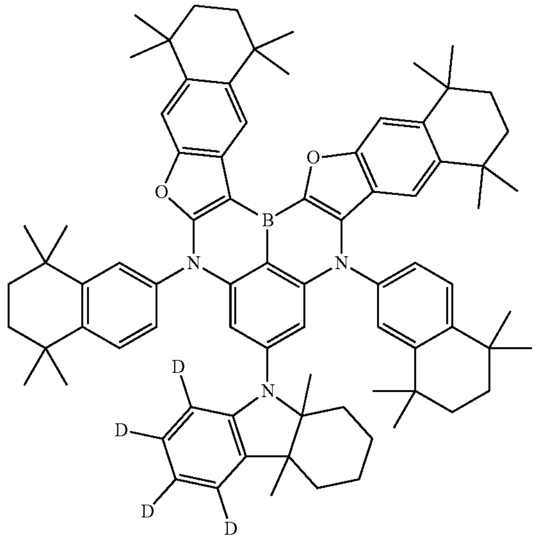

-continued
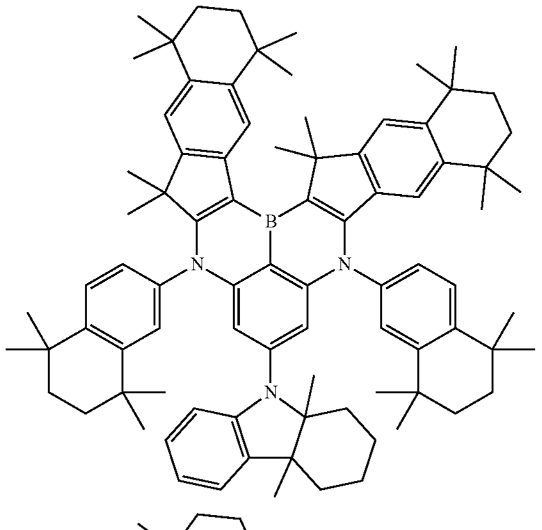
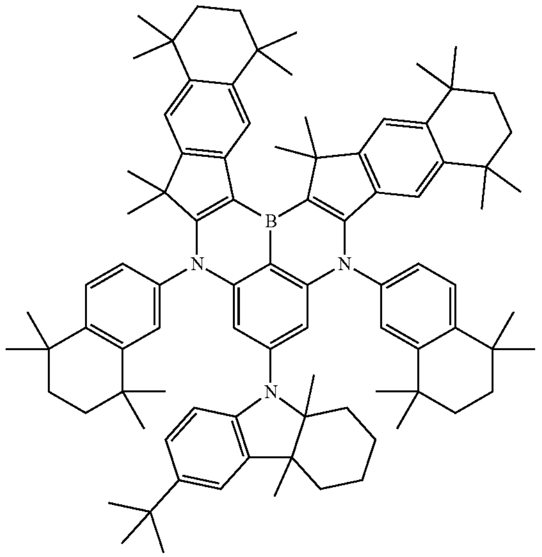
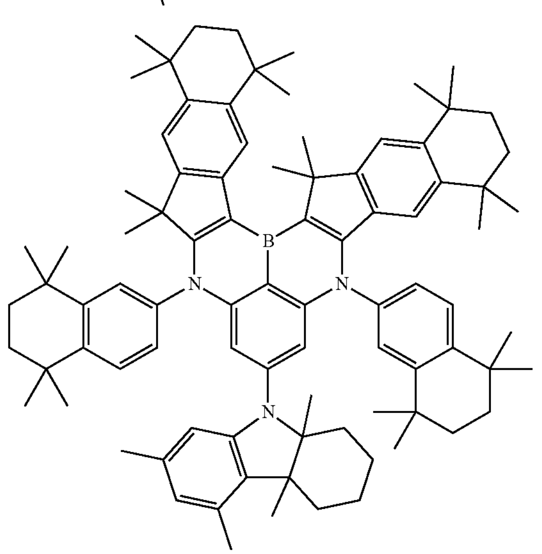
-continued
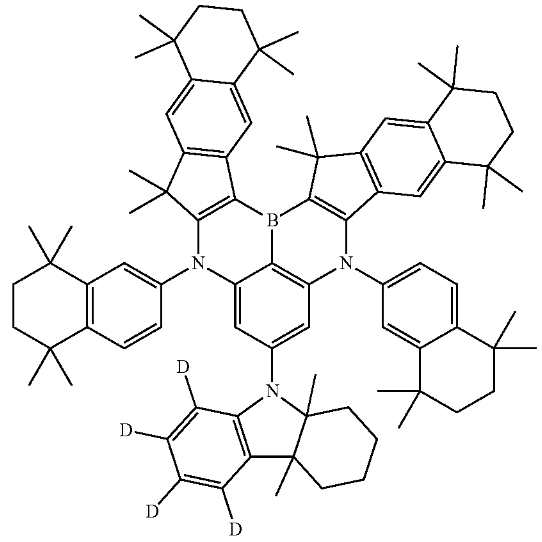
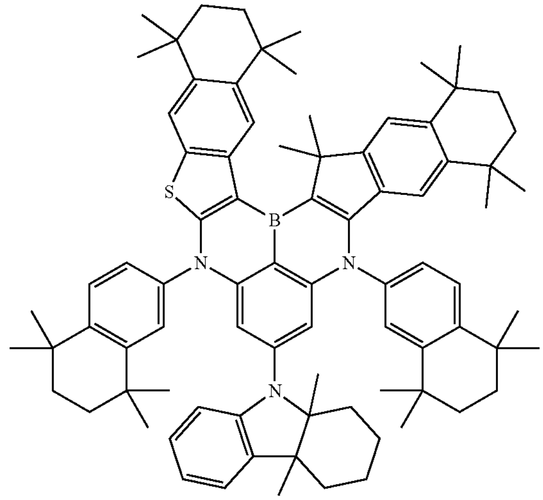
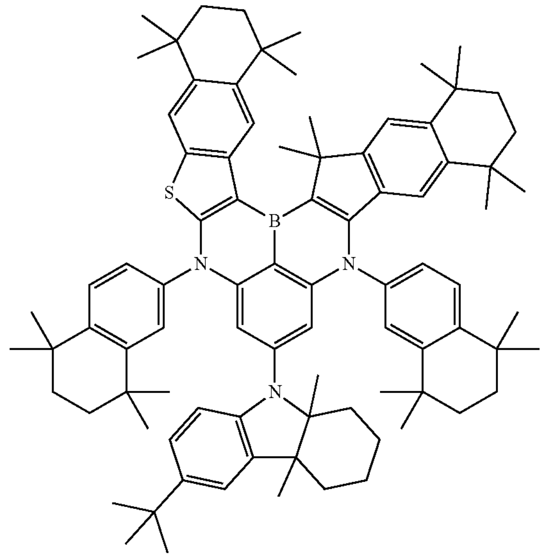

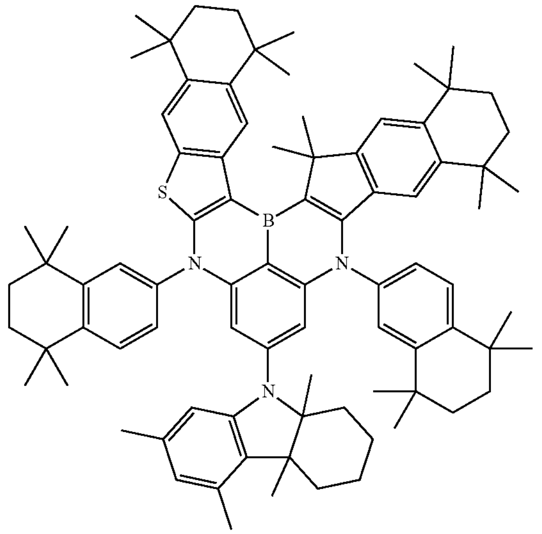
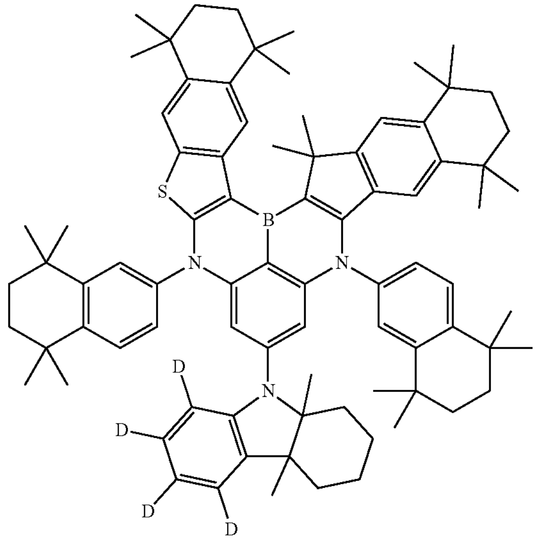
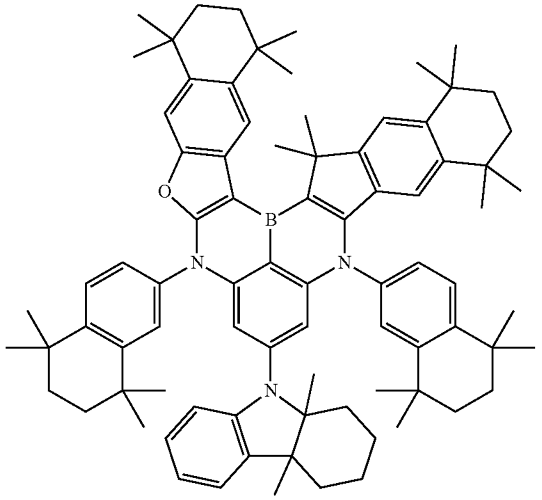
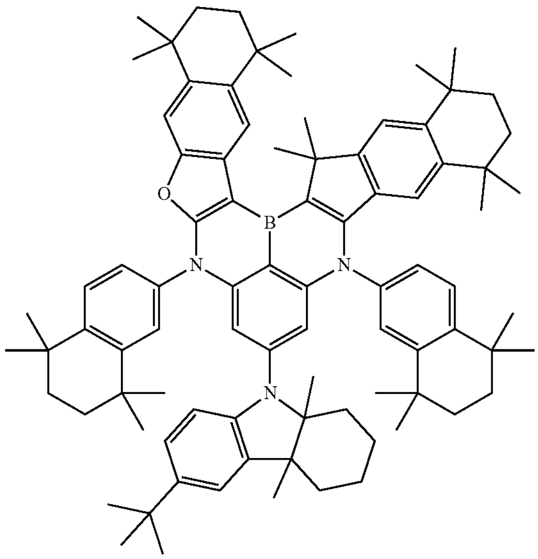
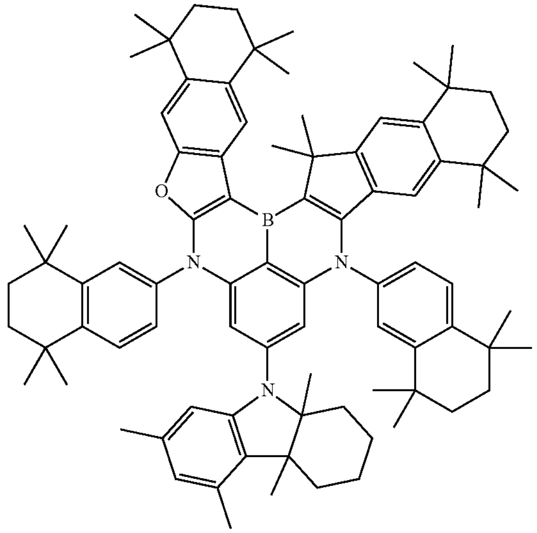
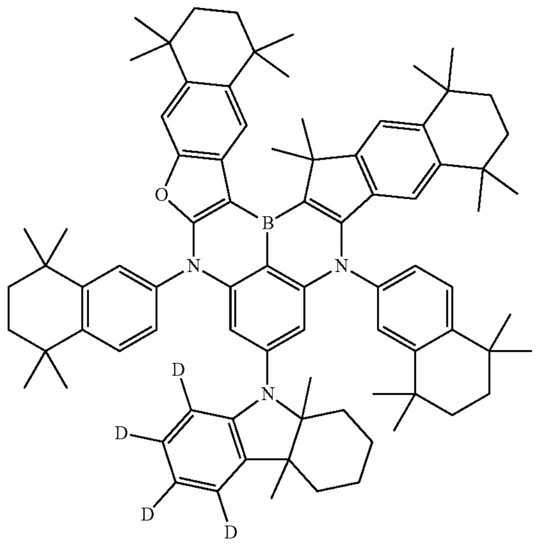

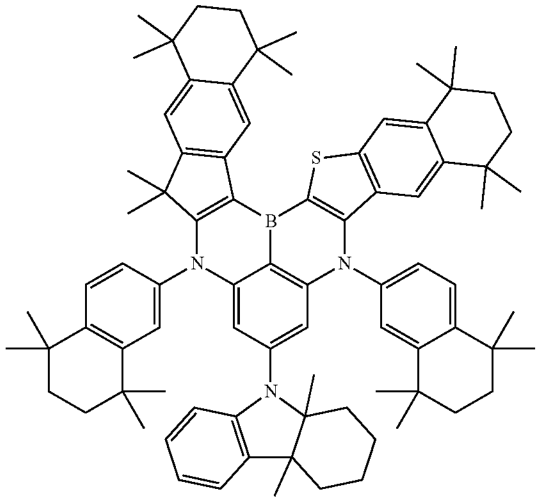
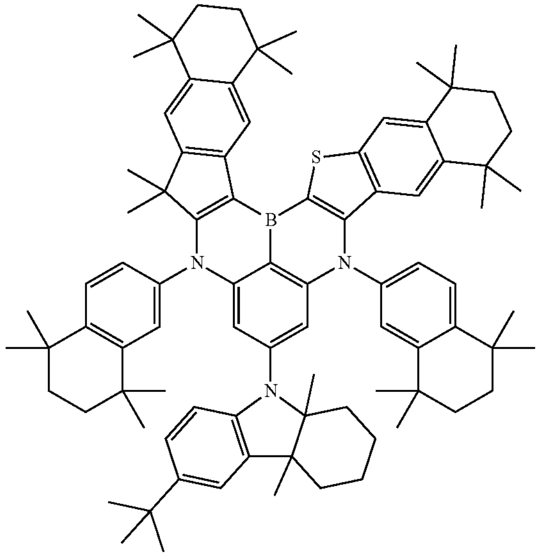
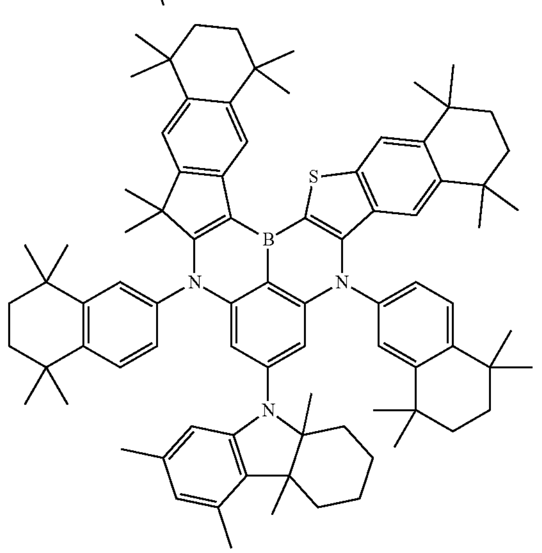
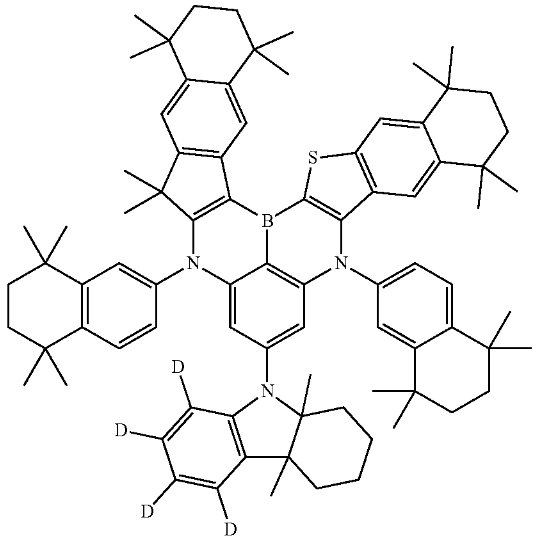
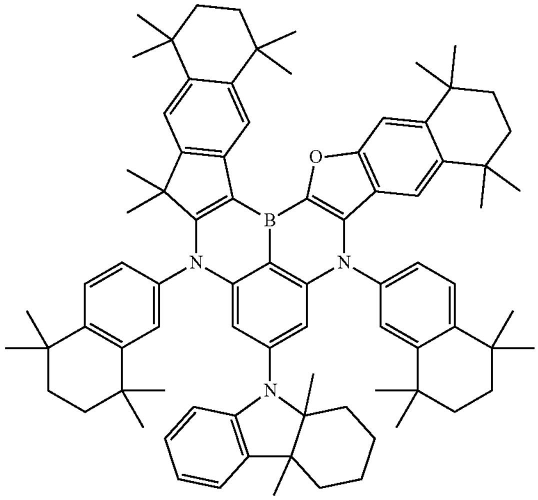
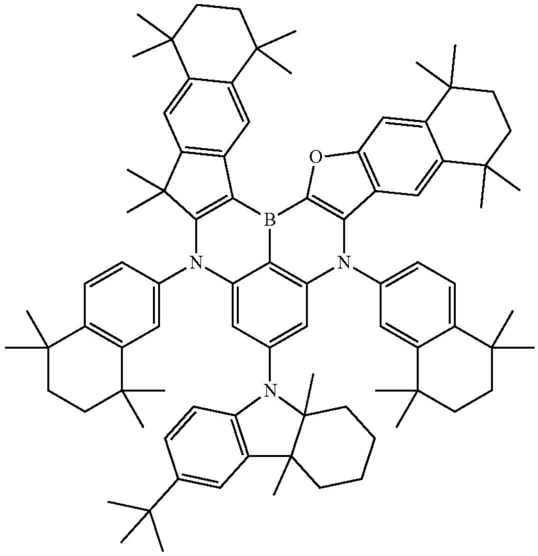

-continued
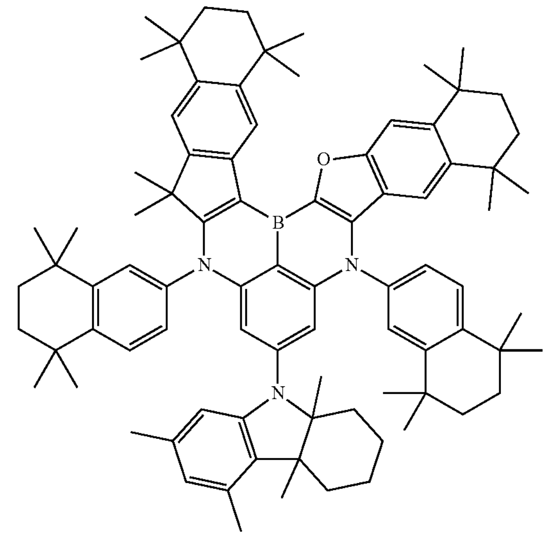
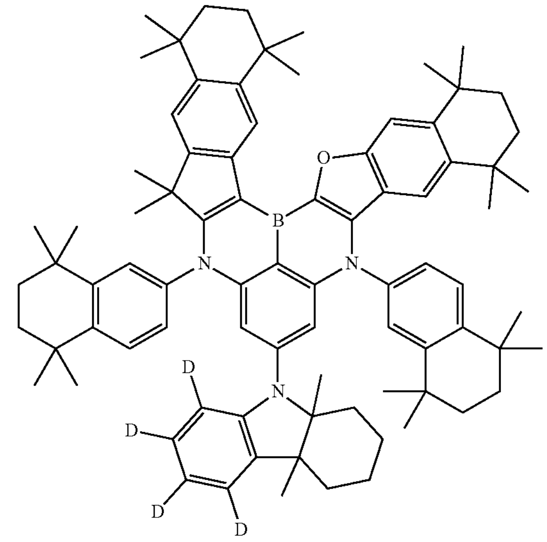
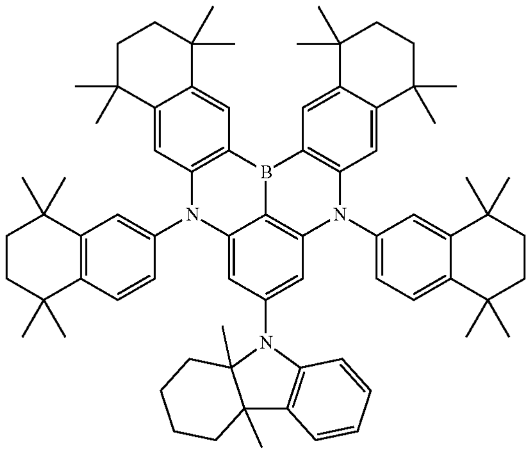
-continued
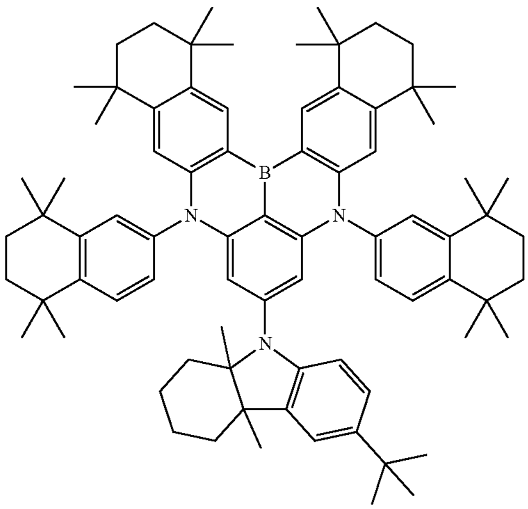
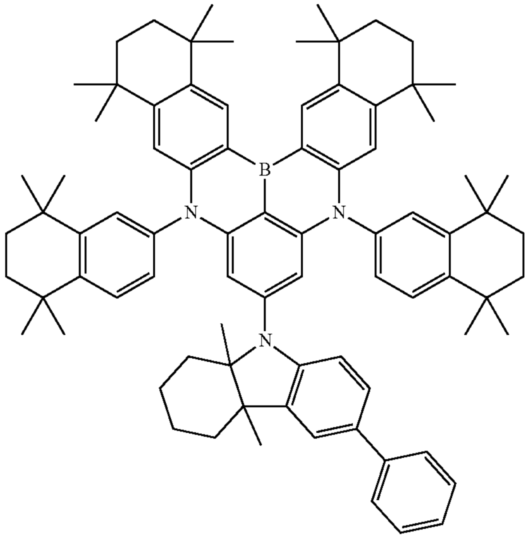
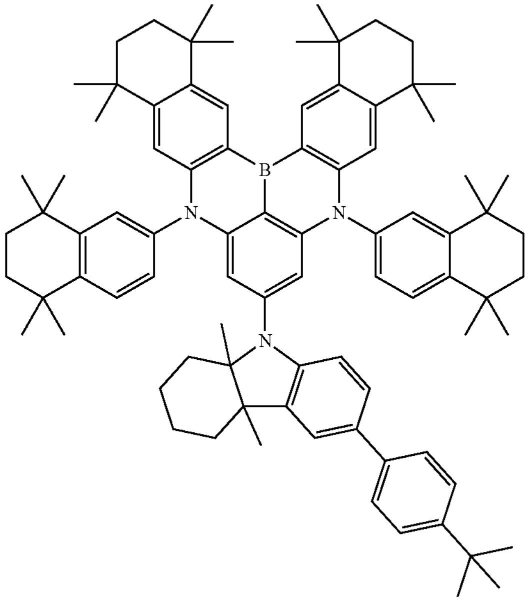

-continued
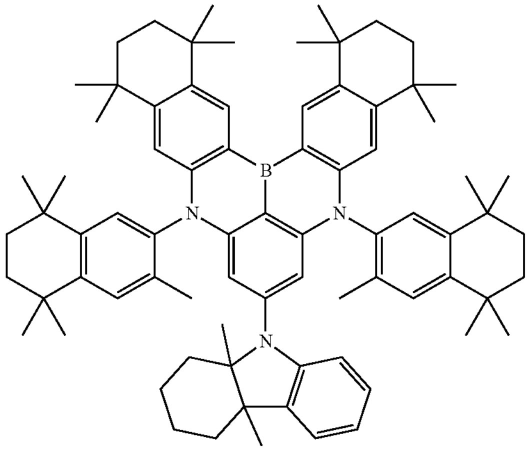
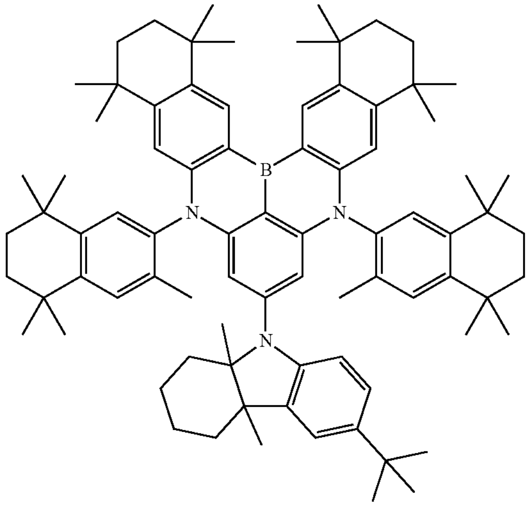
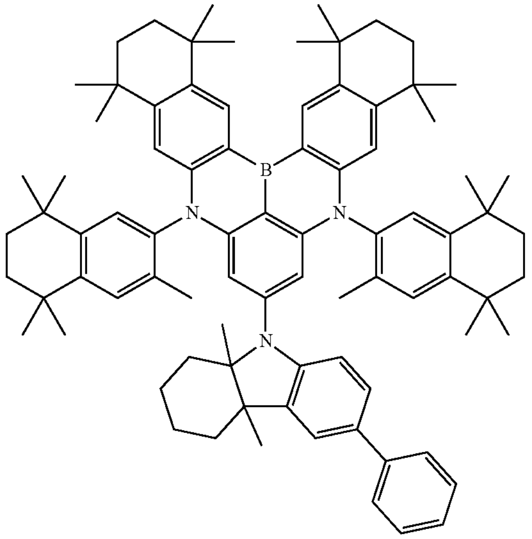
-continued
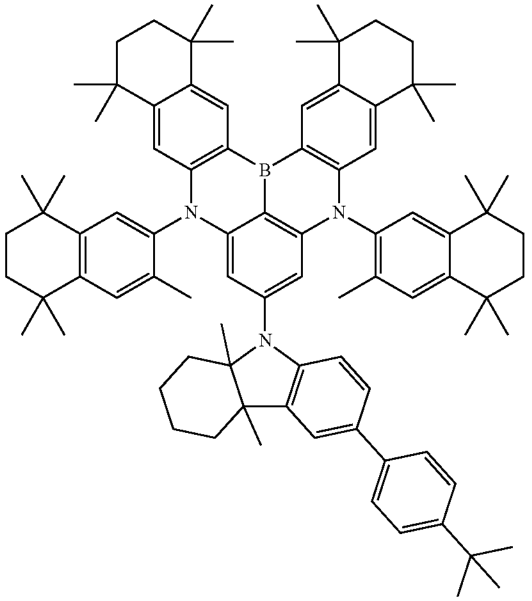
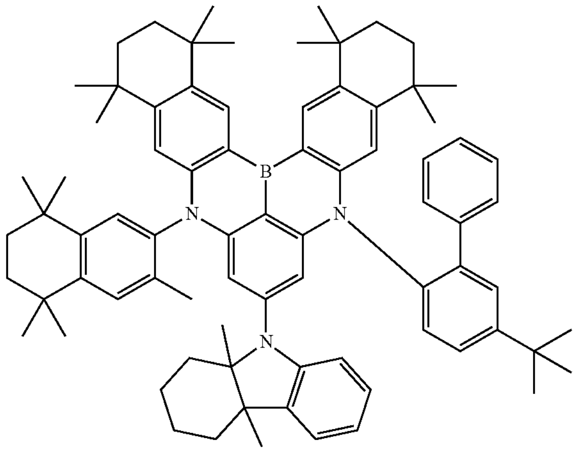
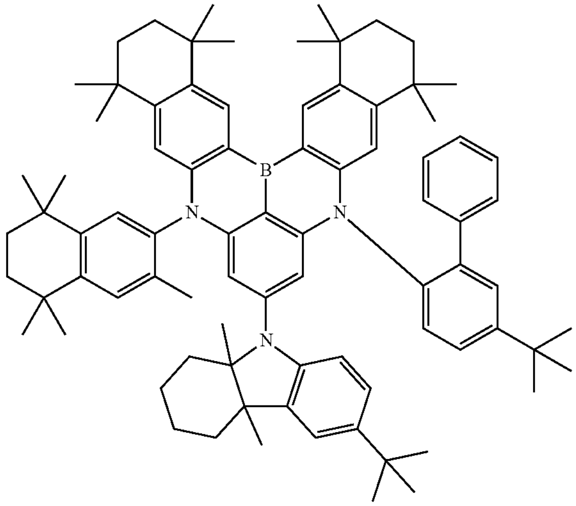

-continued
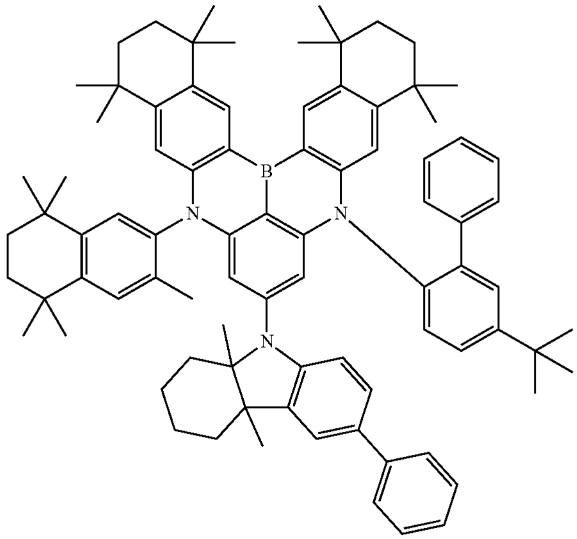
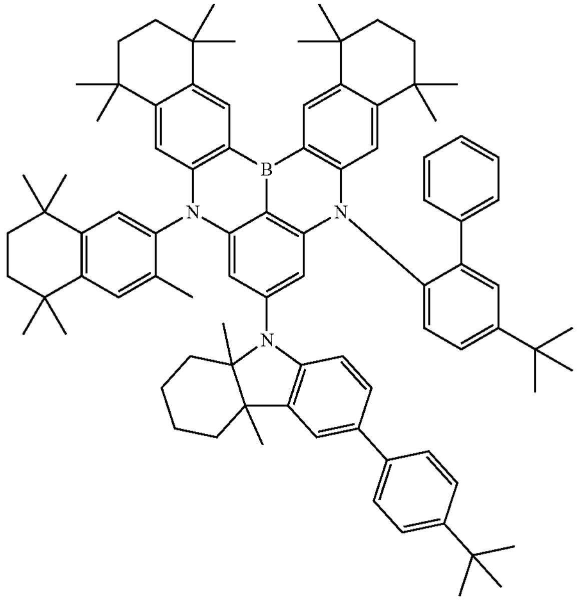
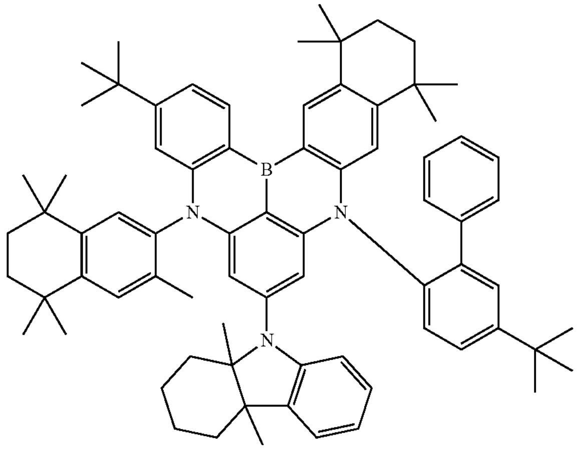
-continued
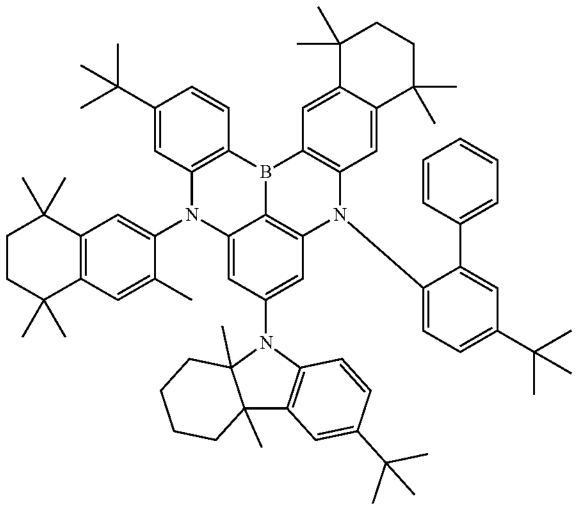
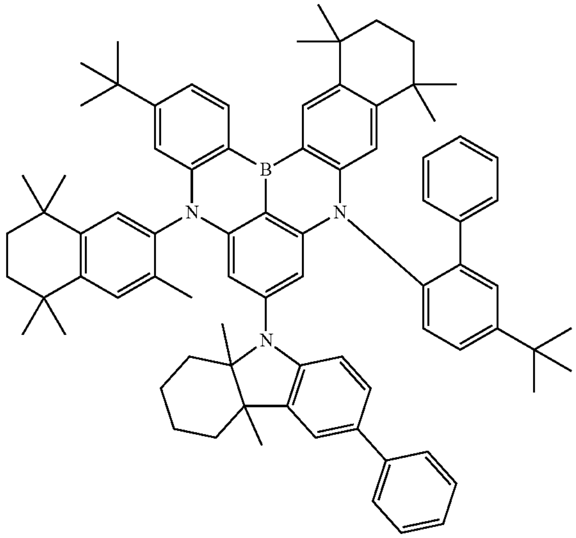
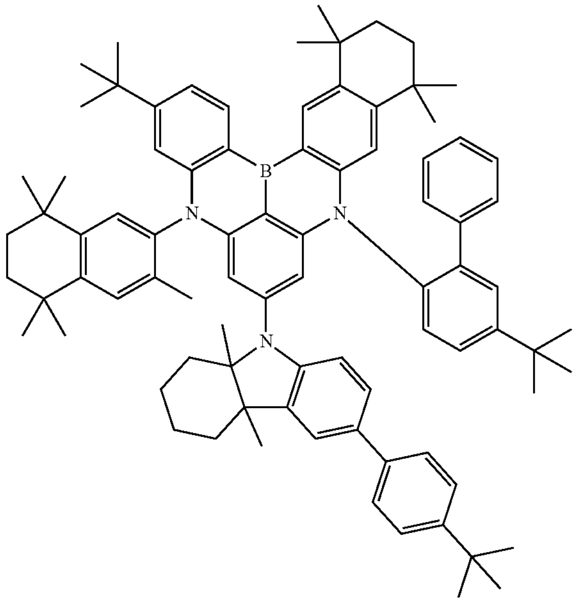

-continued
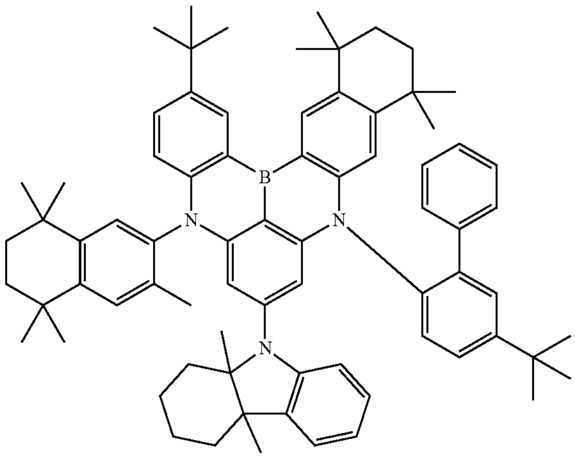
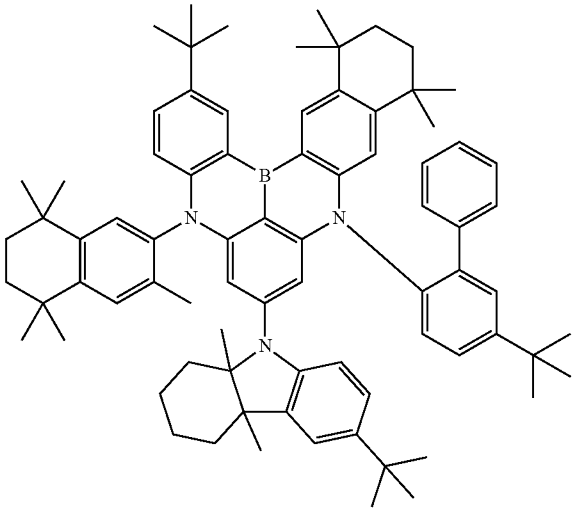
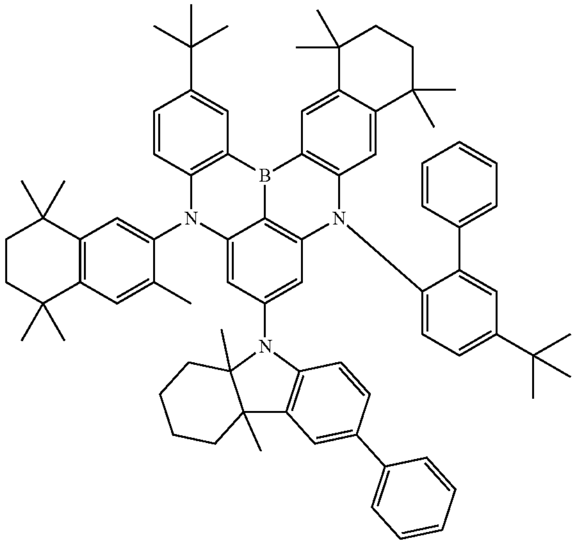
-continued
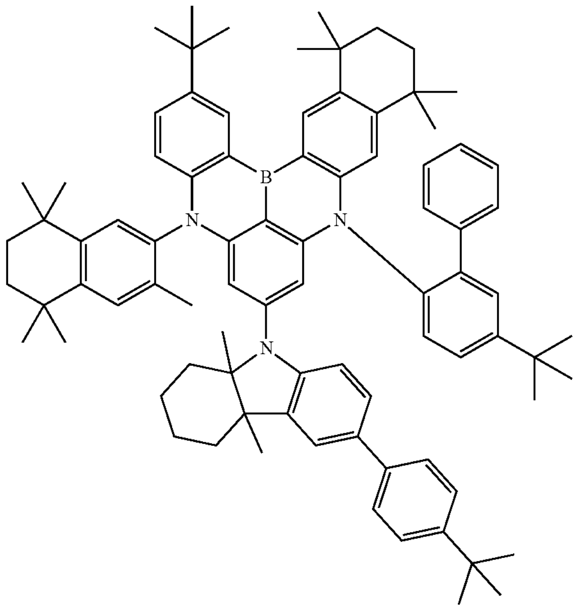
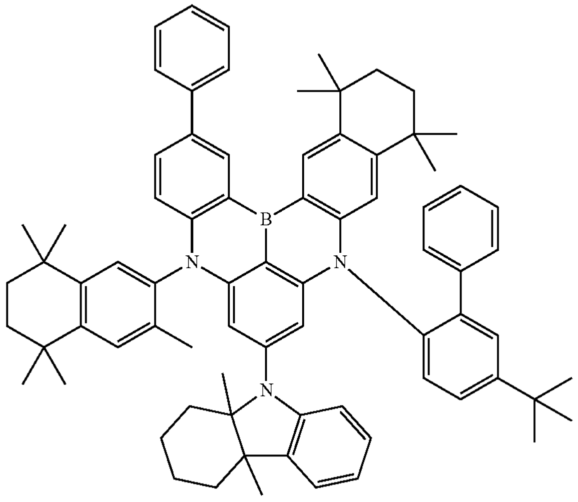
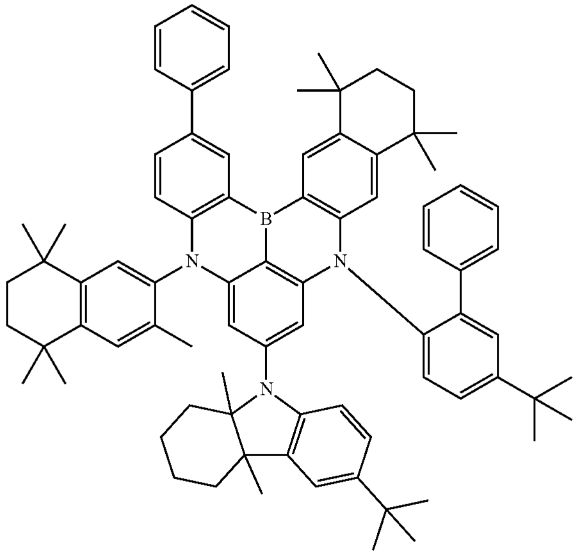

-continued
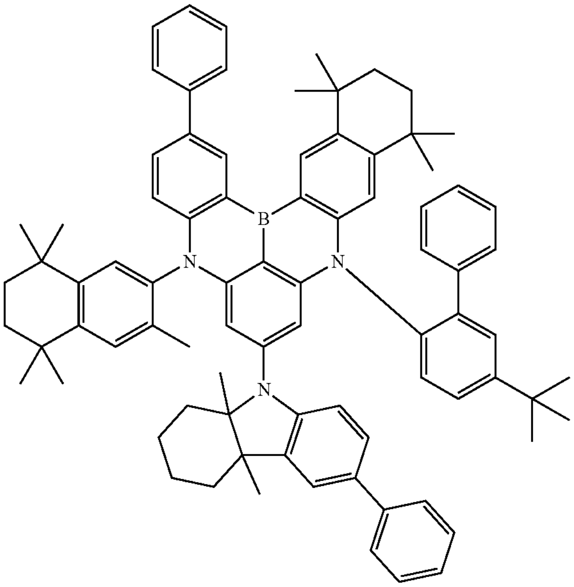
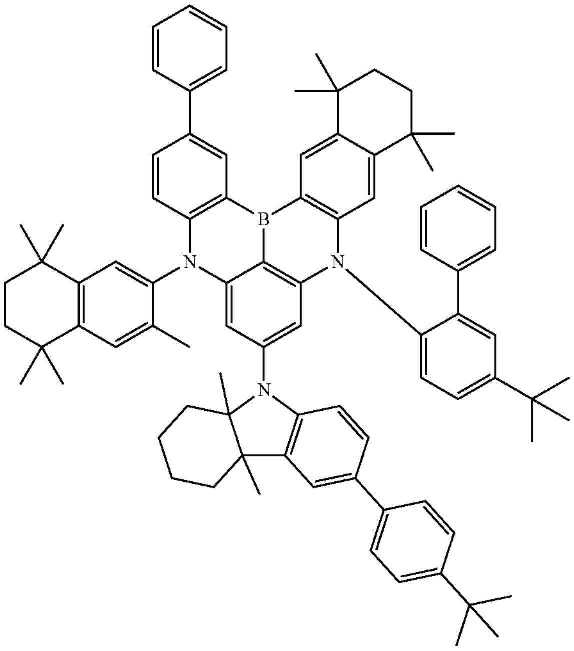
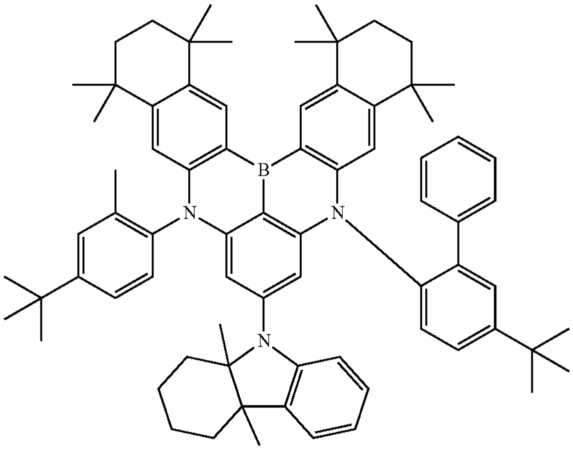
-continued
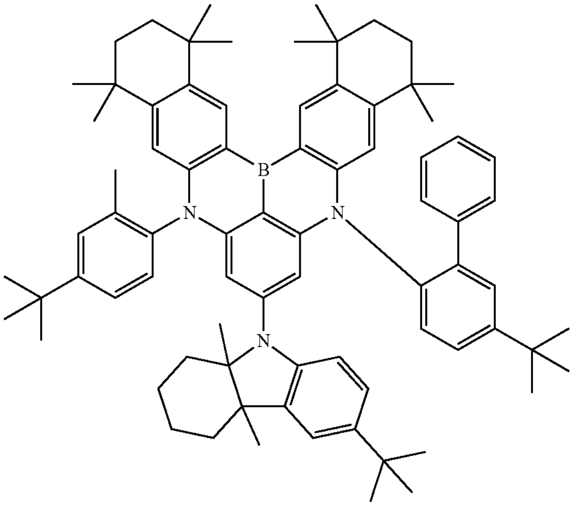
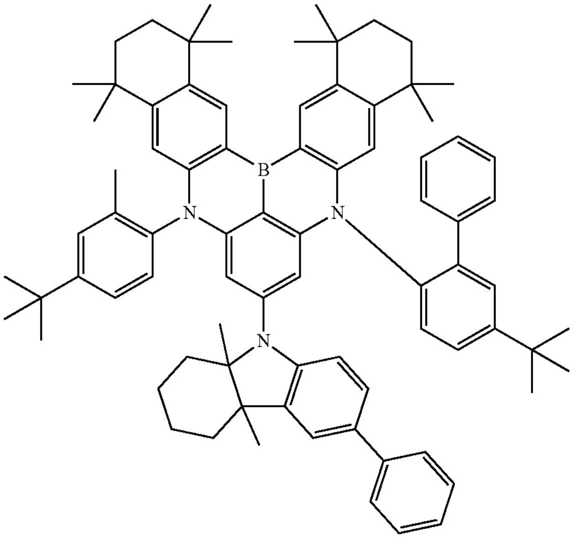
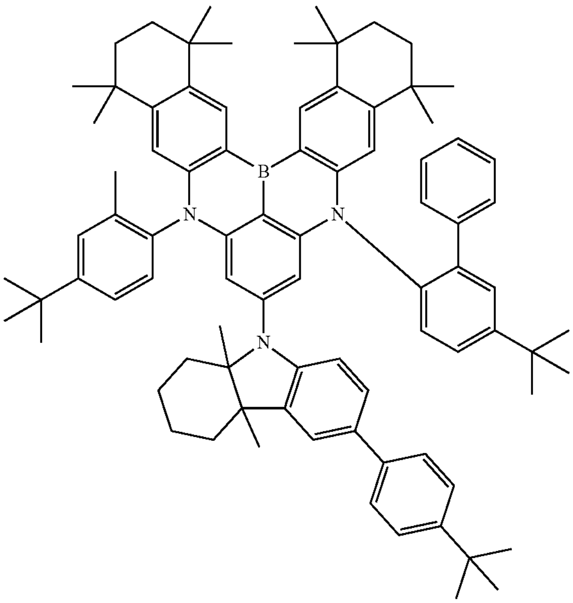

-continued
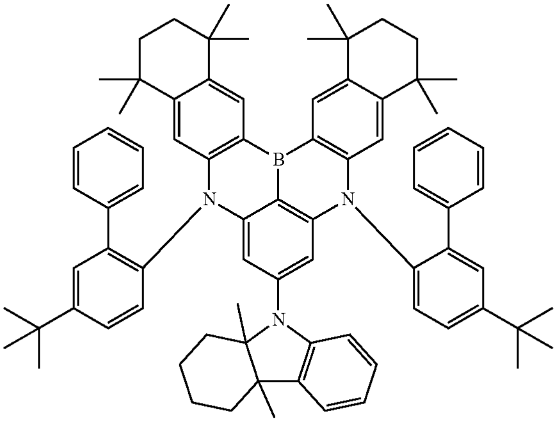
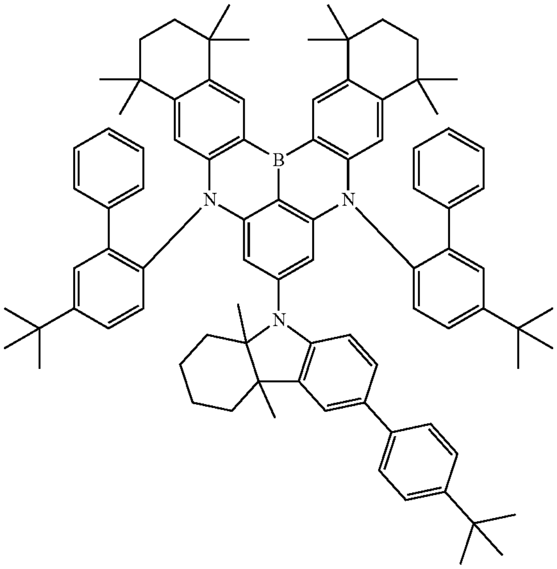
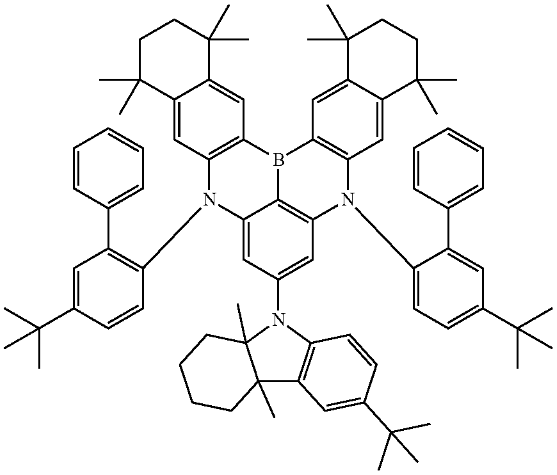
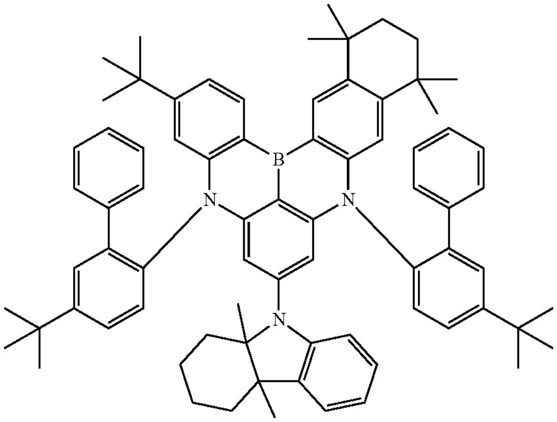
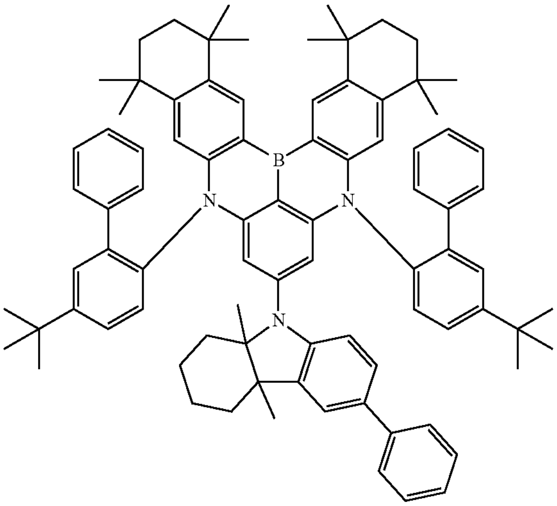
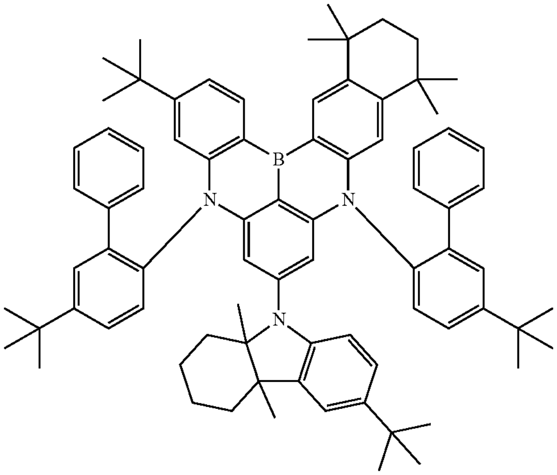

-continued
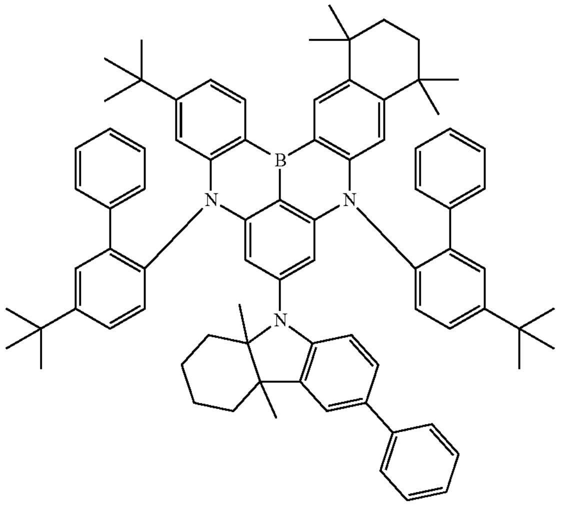
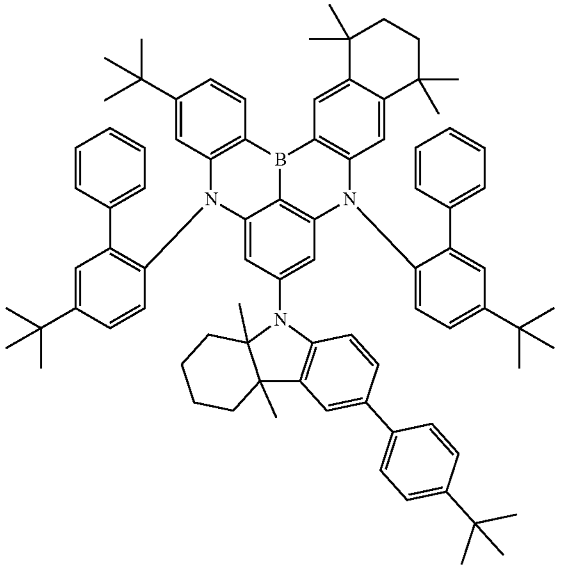
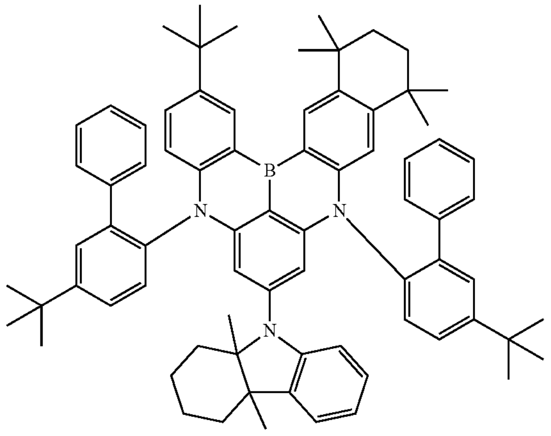
-continued
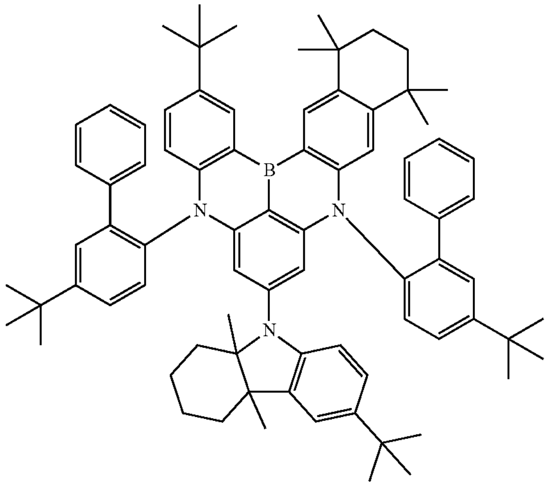
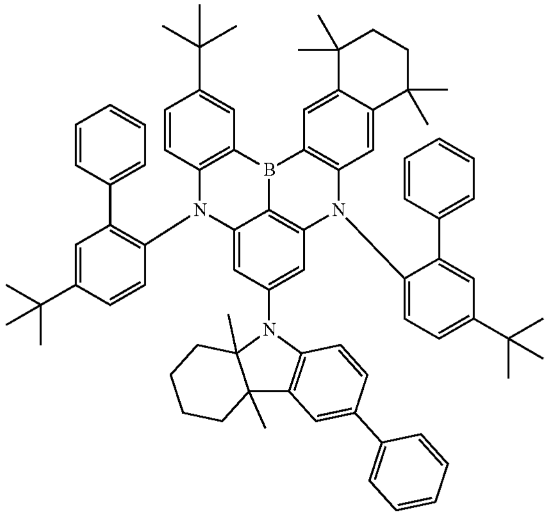
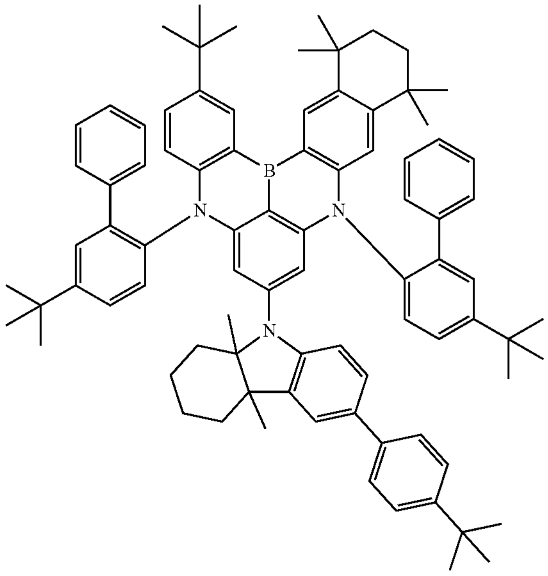 [SMILES: CC(C)(C)c1ccc(-c2ccc3c(c2)C2(C)CCCCC2(C)N3c2cc3c4c(c2)N(c2ccc(C(C)(C)C)cc2-c2ccccc2)c2cc5c(cc2B4c2cc(C(C)(C)C)ccc2N3c2ccc(C(C)(C)C)cc2-c2ccccc2)C(C)(C)CCC5(C)C)cc1]

-continued
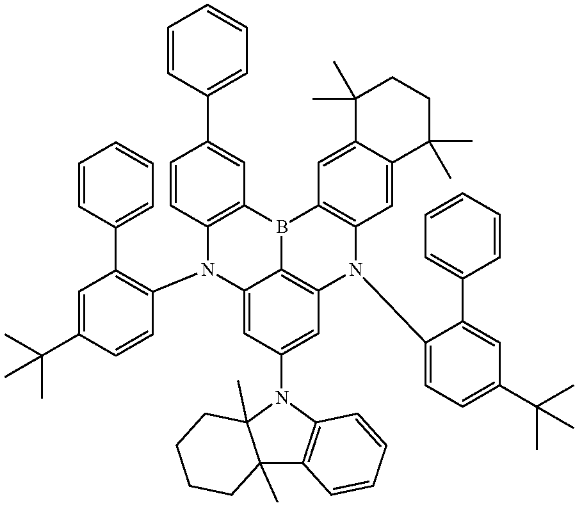
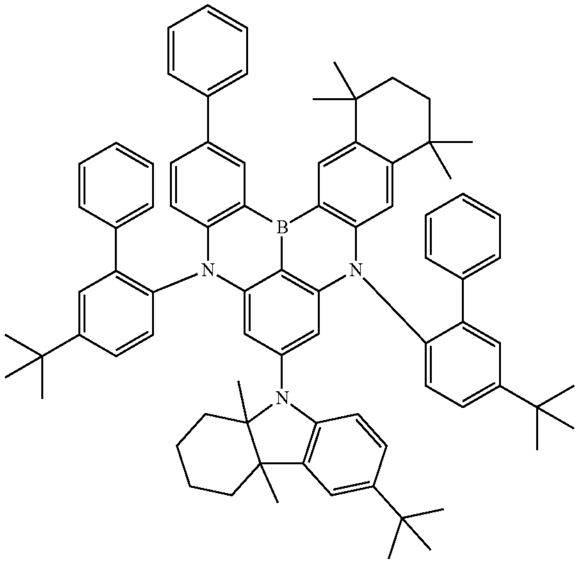
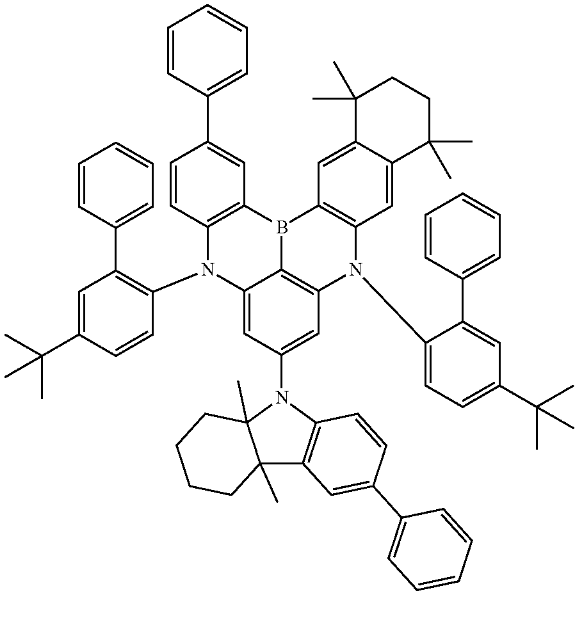
-continued
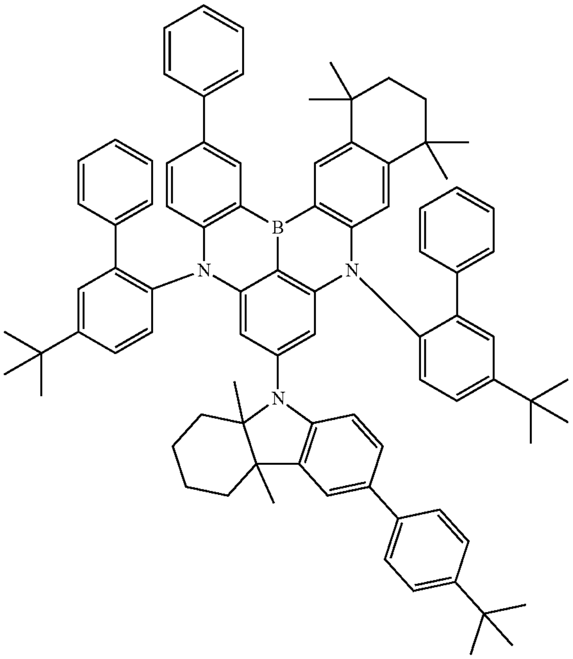
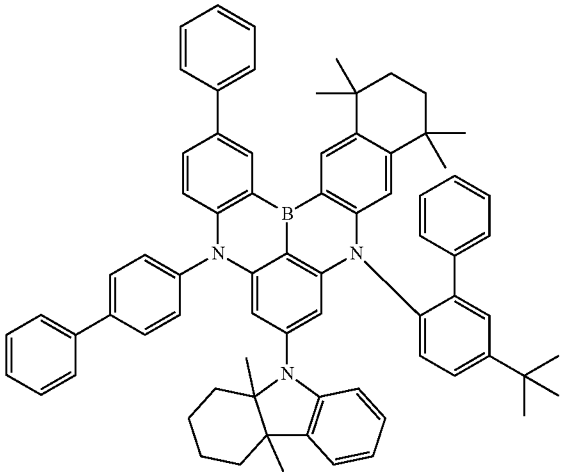
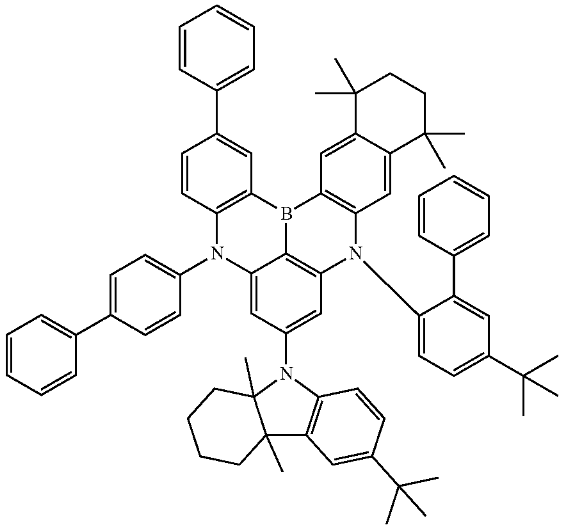

-continued
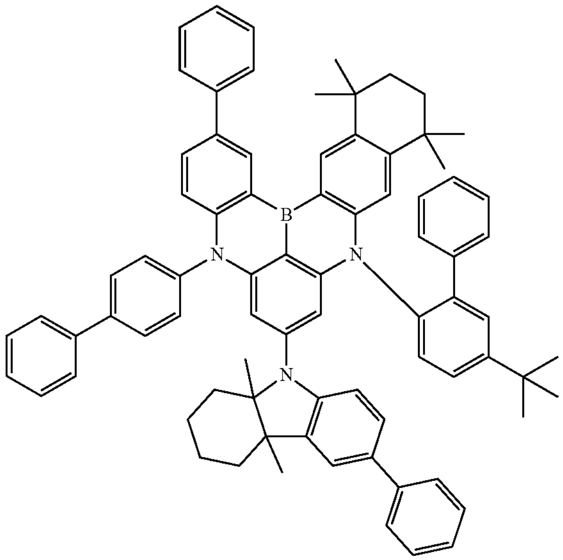
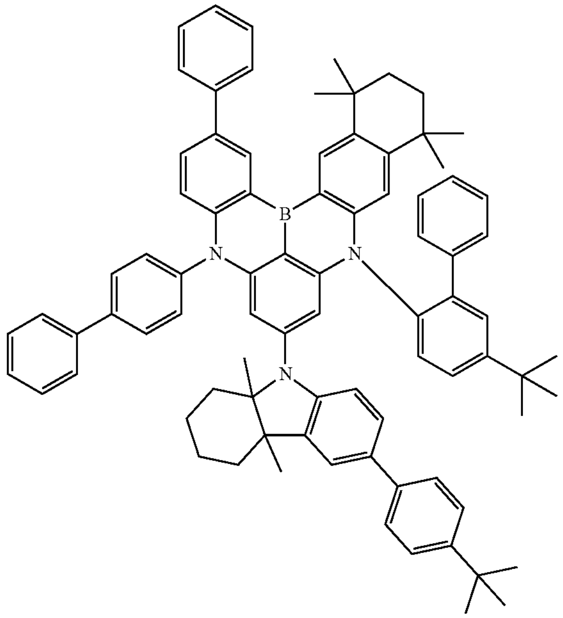
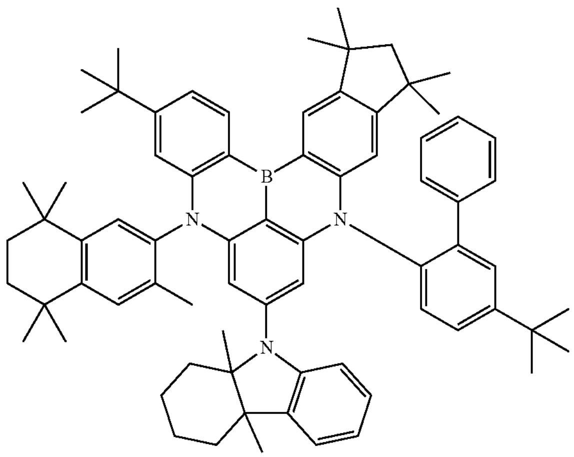
-continued
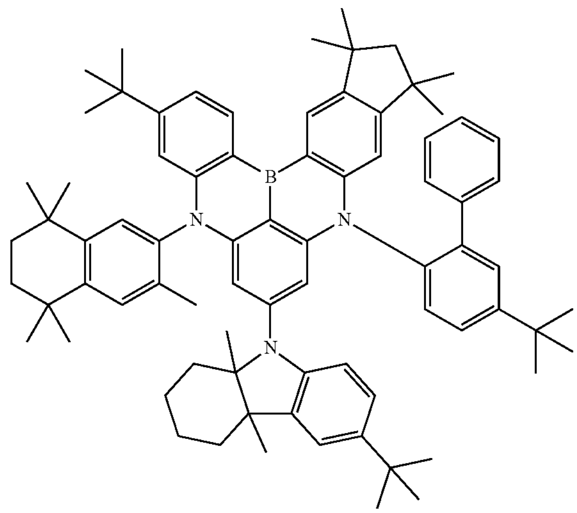
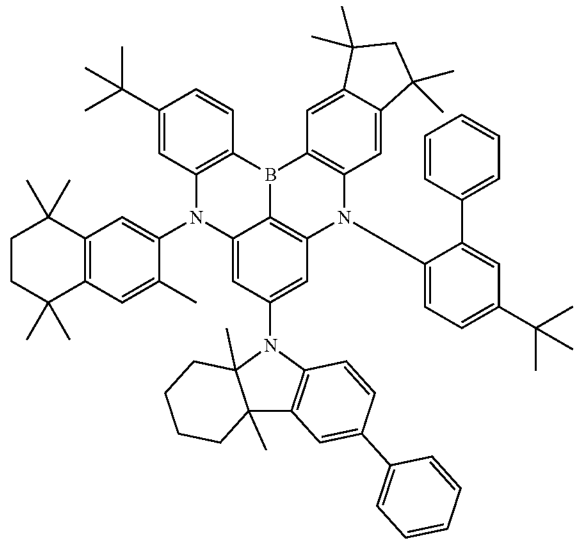
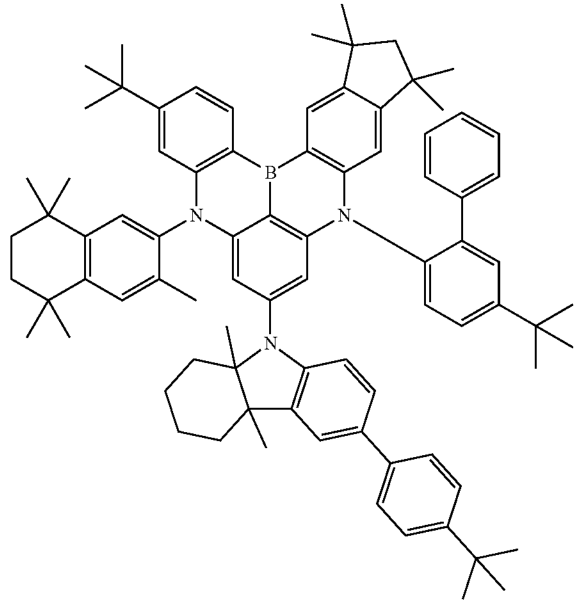

-continued
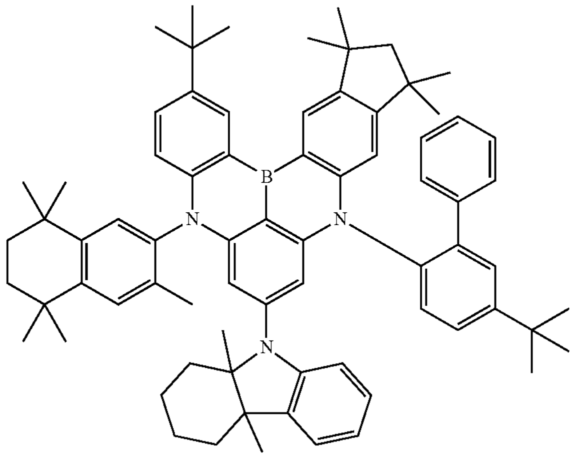
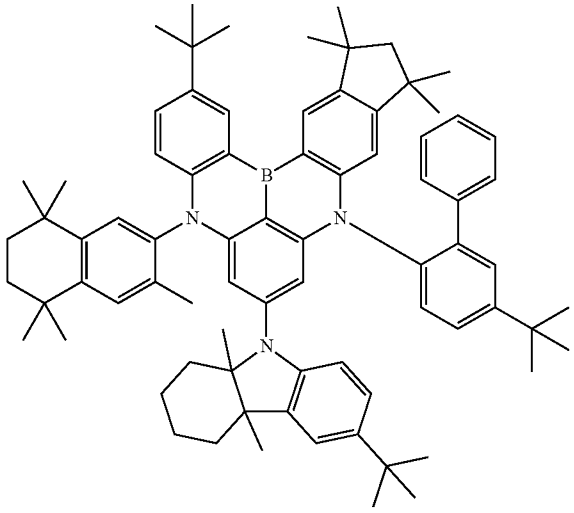
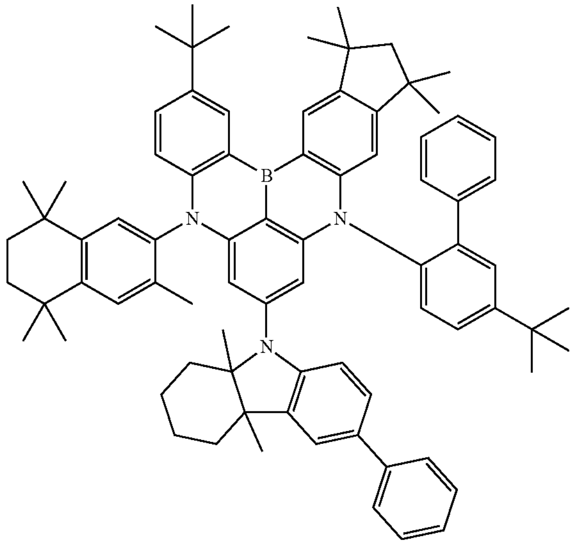
-continued
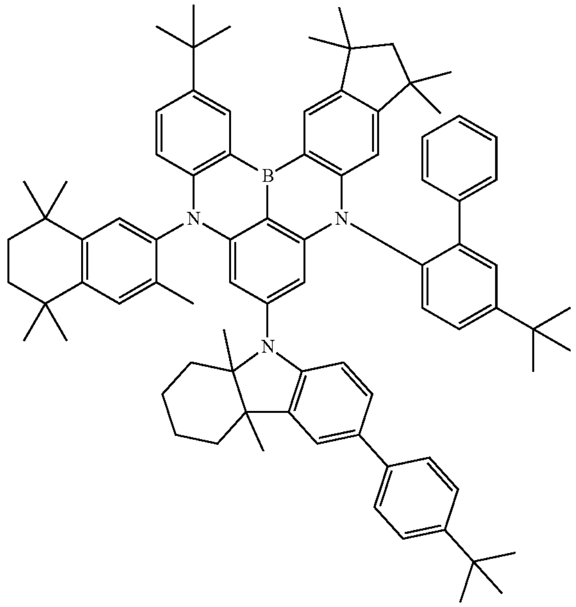
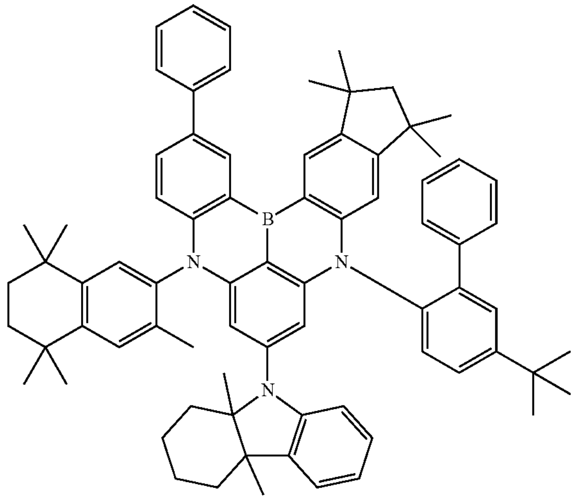
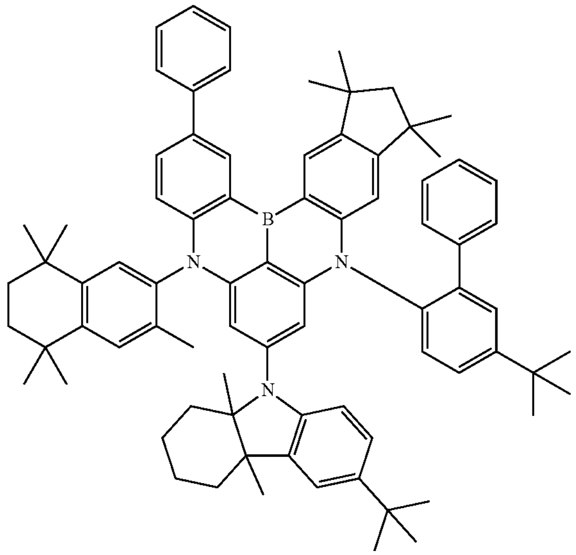

-continued
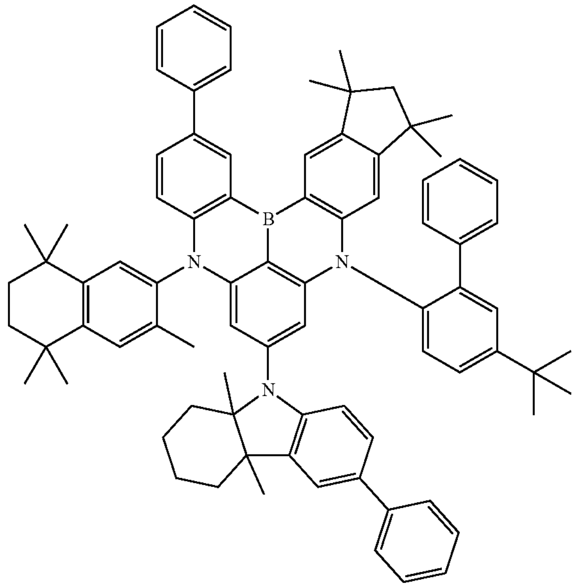
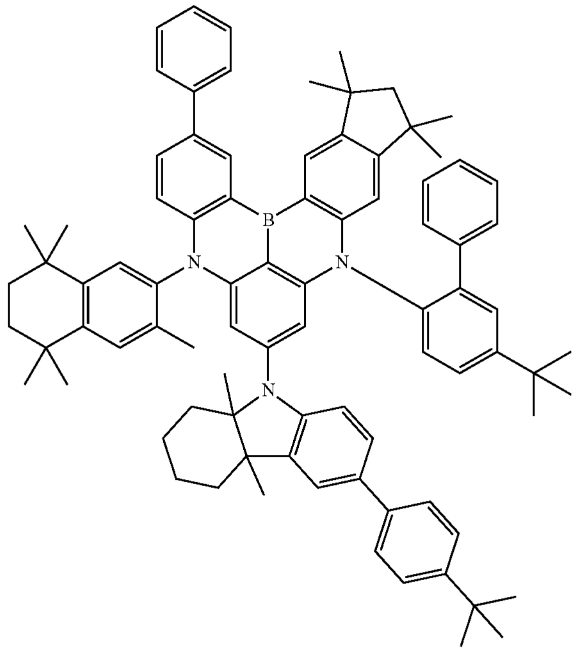
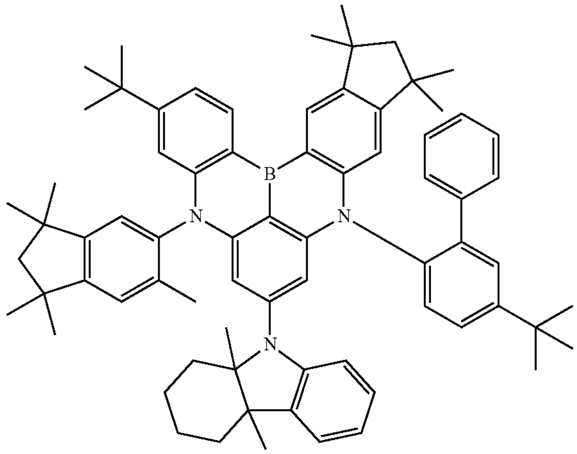
-continued
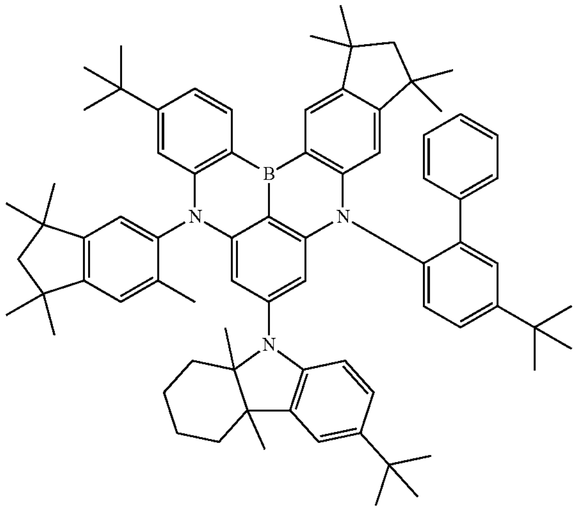
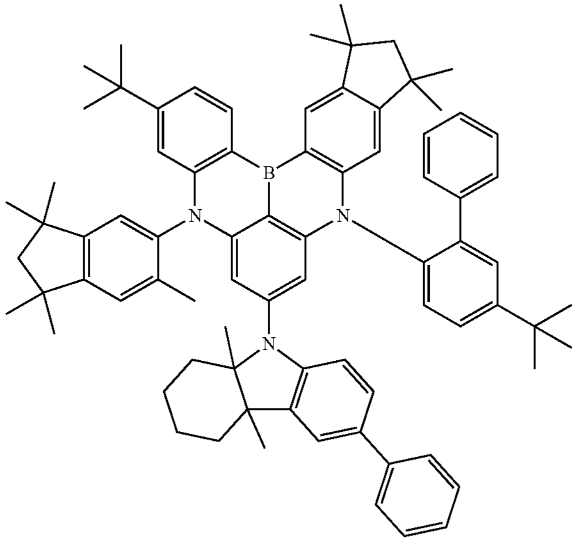
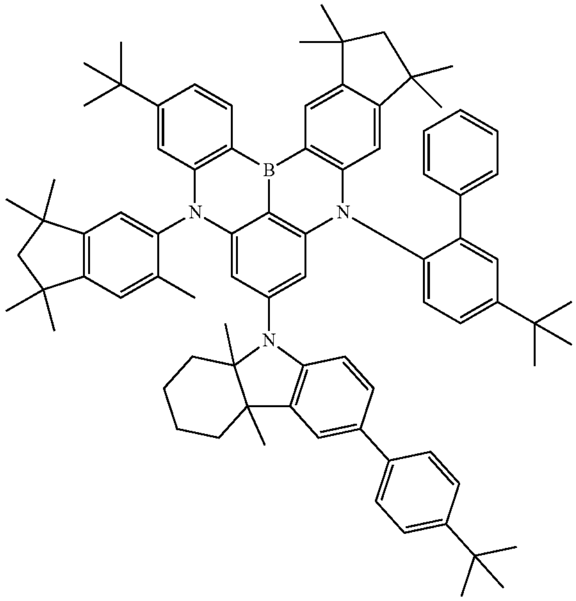

-continued
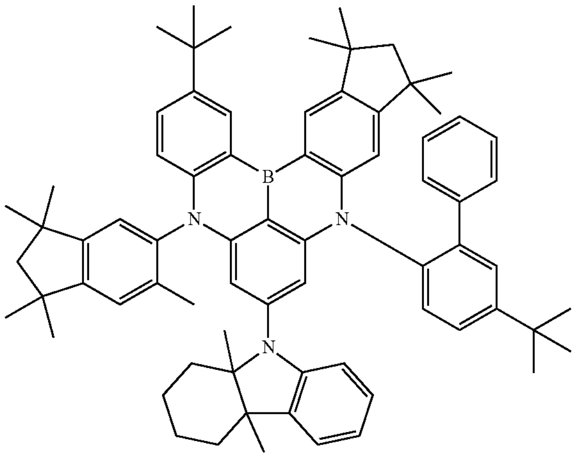
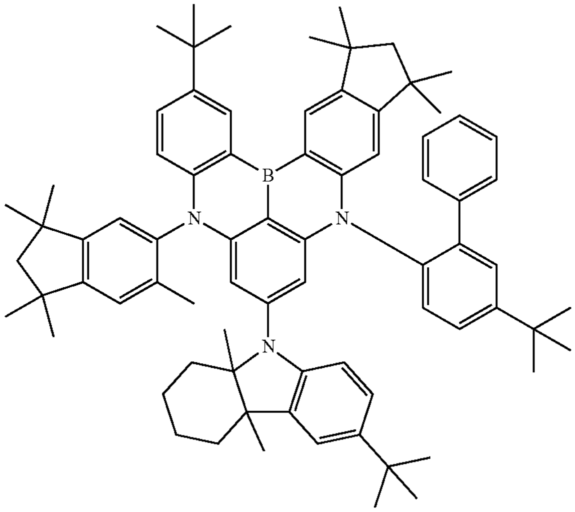
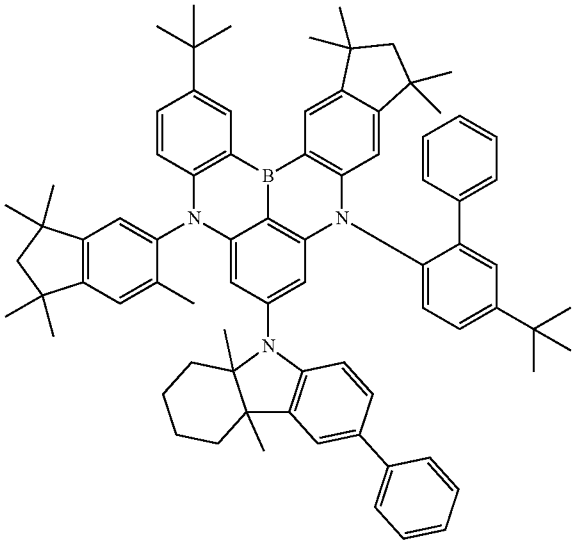
-continued
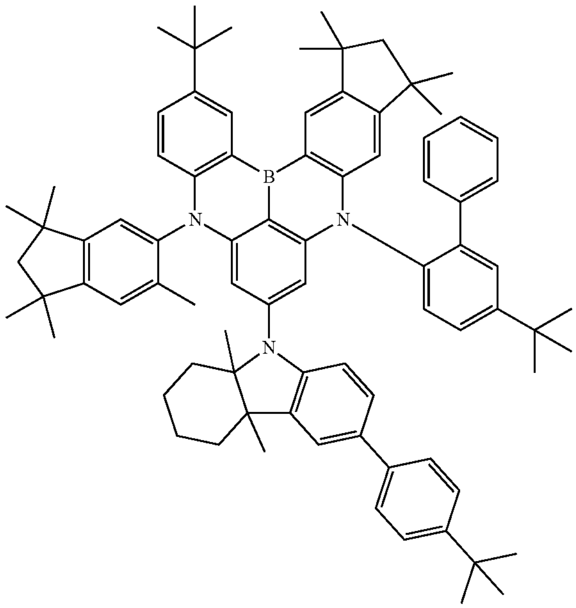
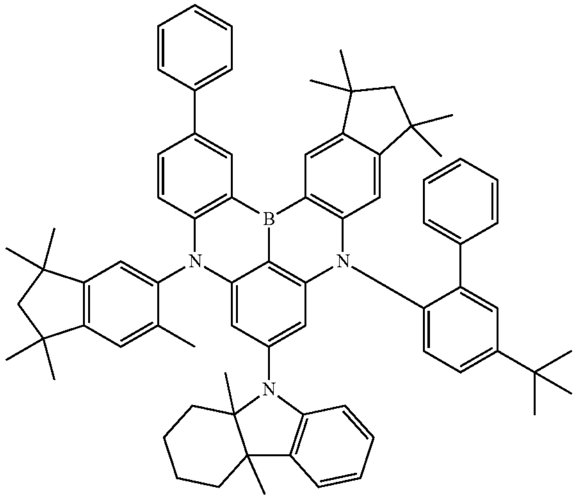
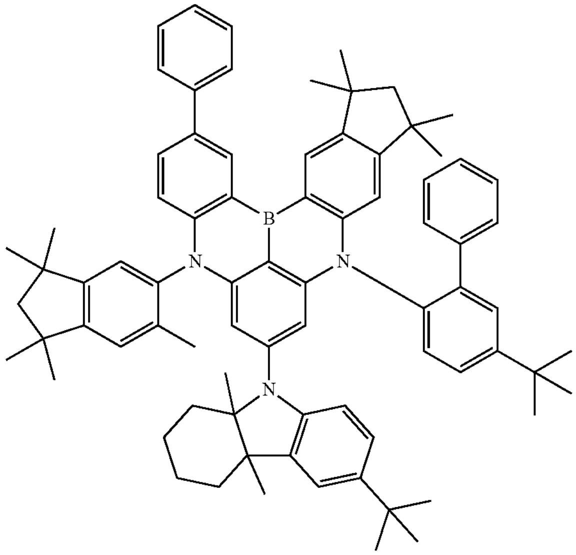

-continued
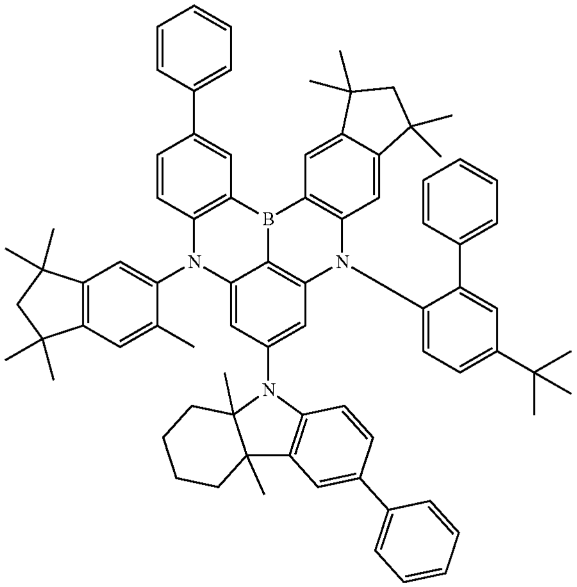
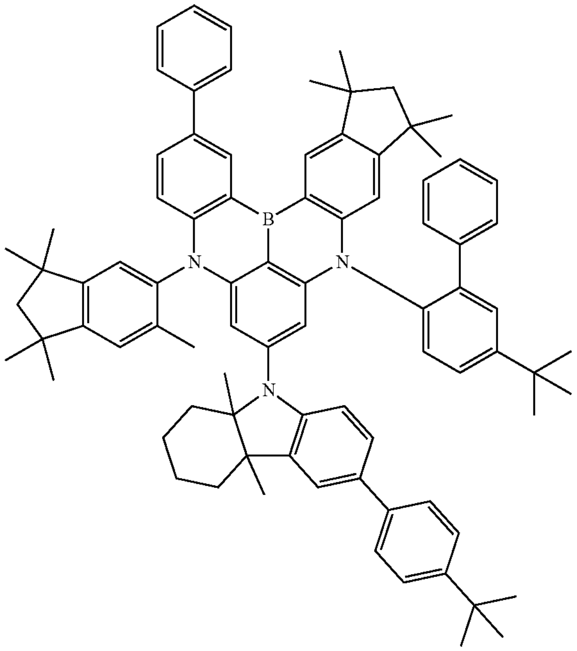
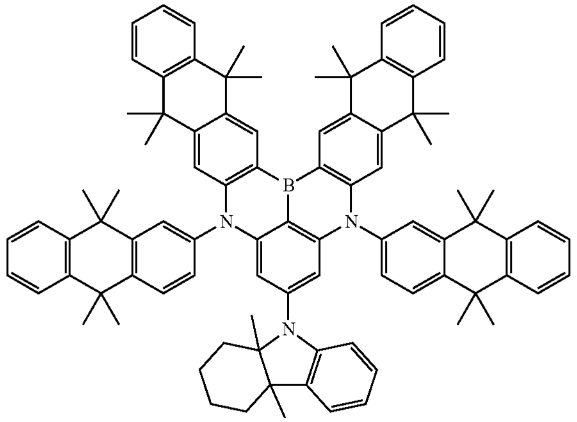
-continued
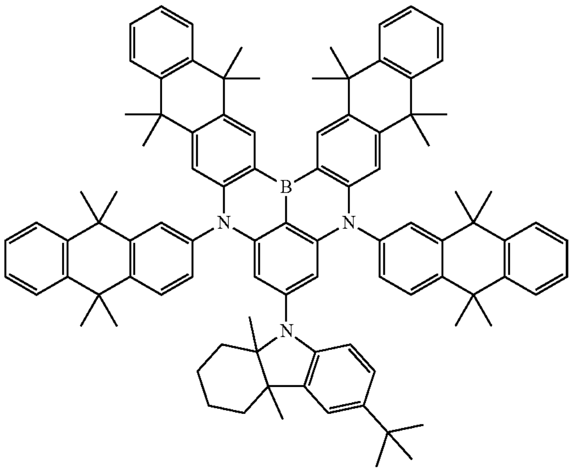
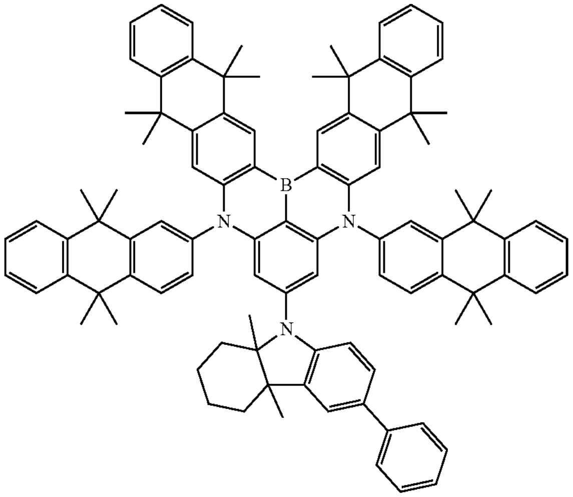
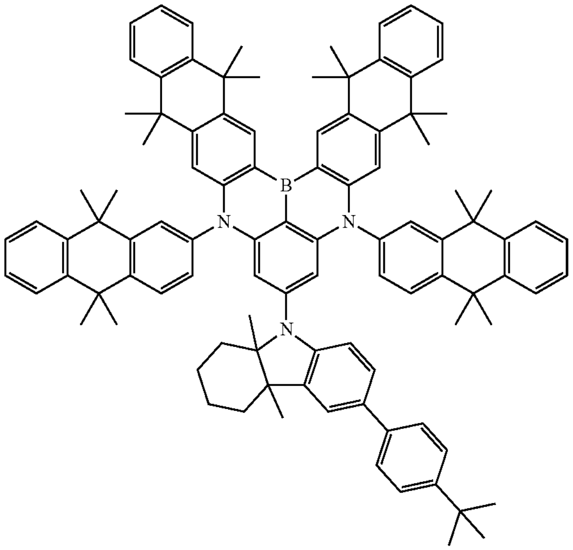

-continued
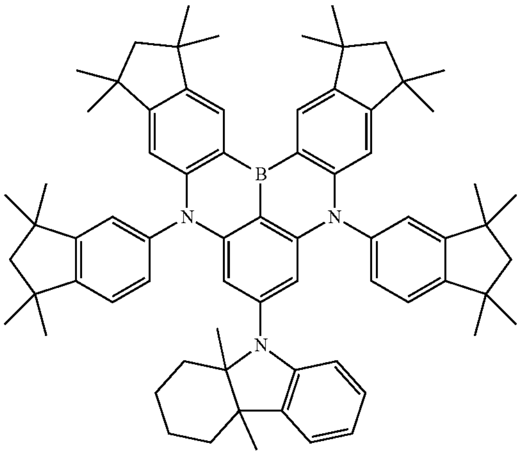
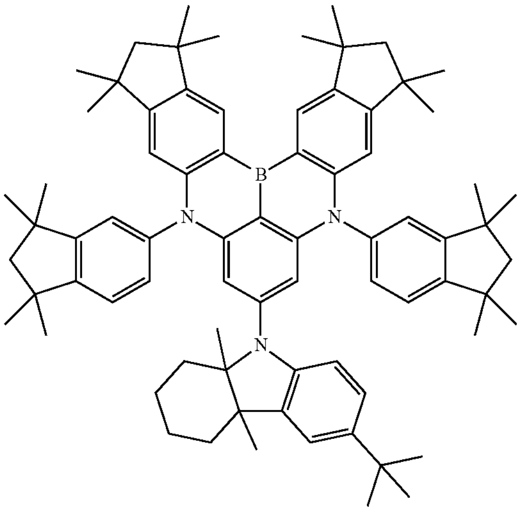
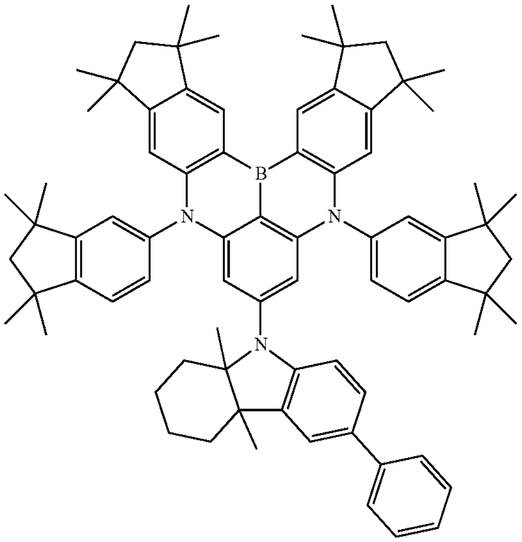
-continued
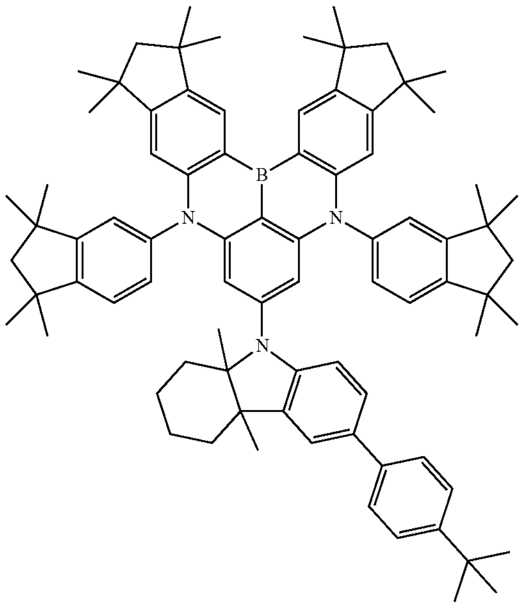
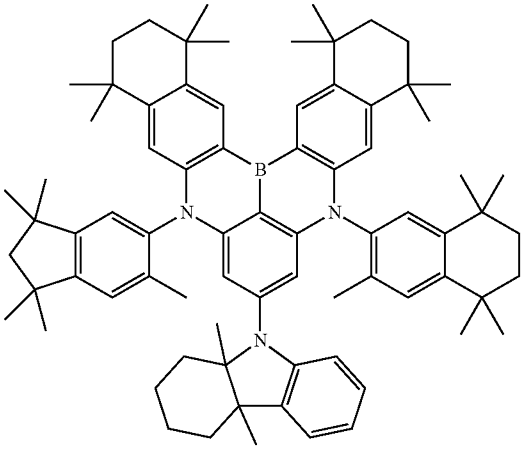
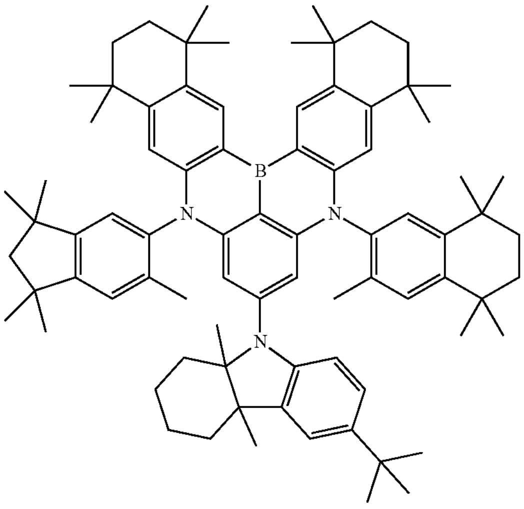

-continued
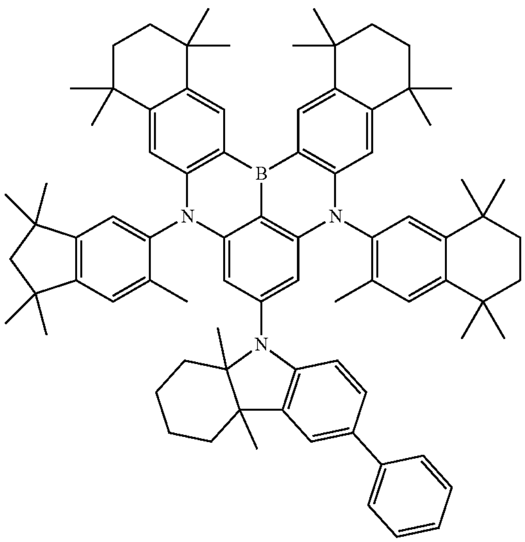
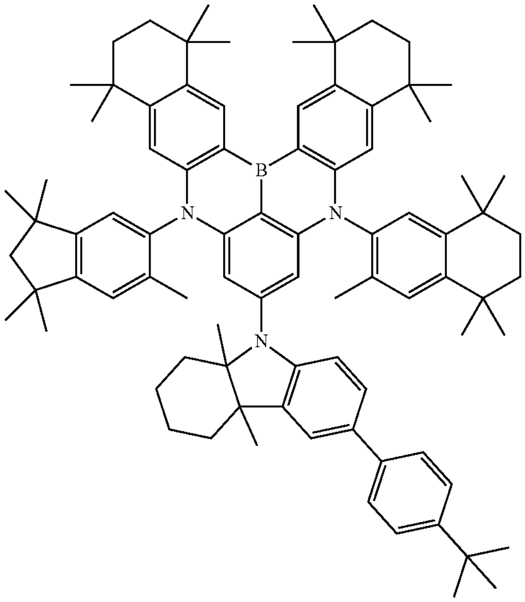
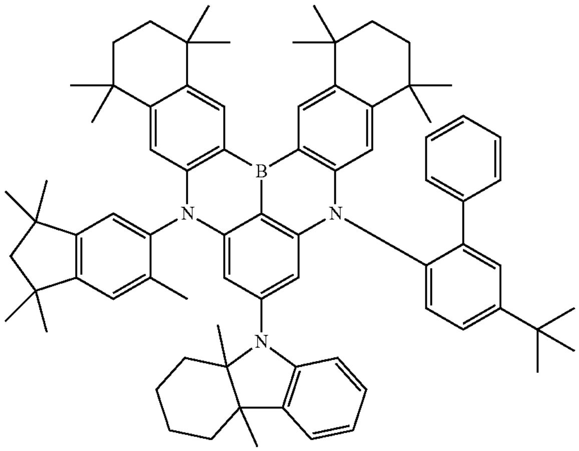
-continued
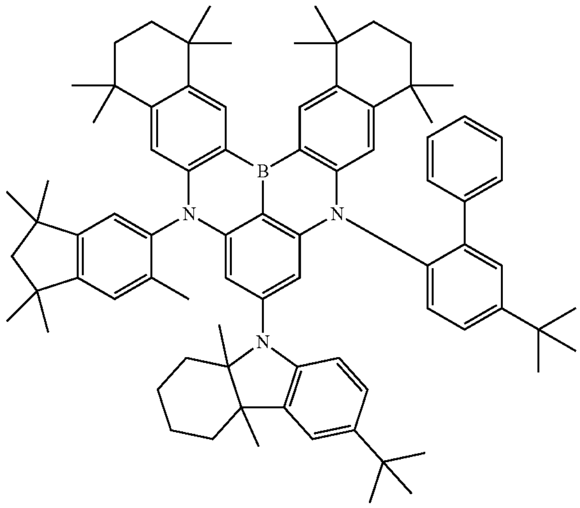
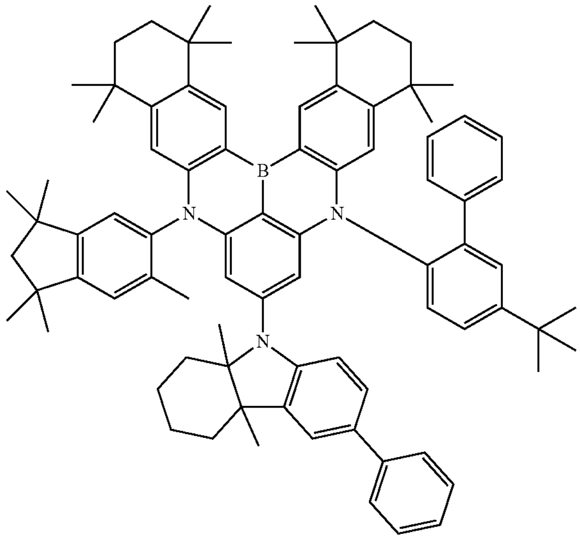
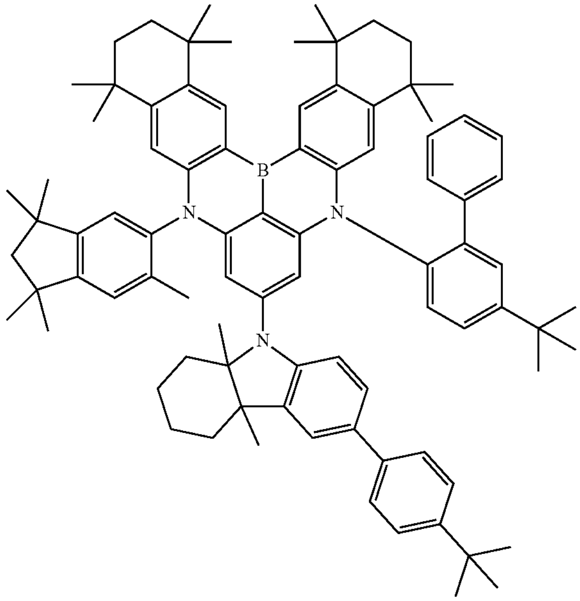

-continued
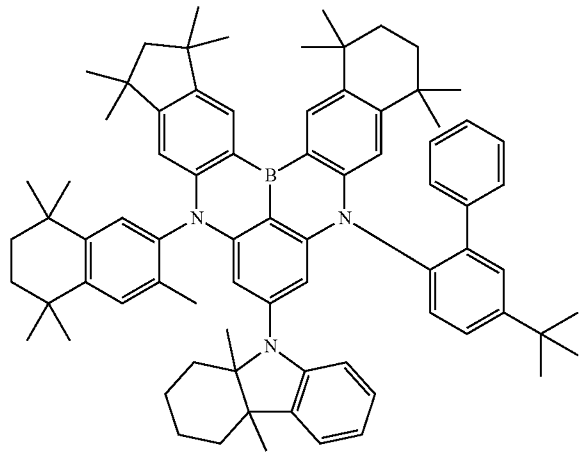
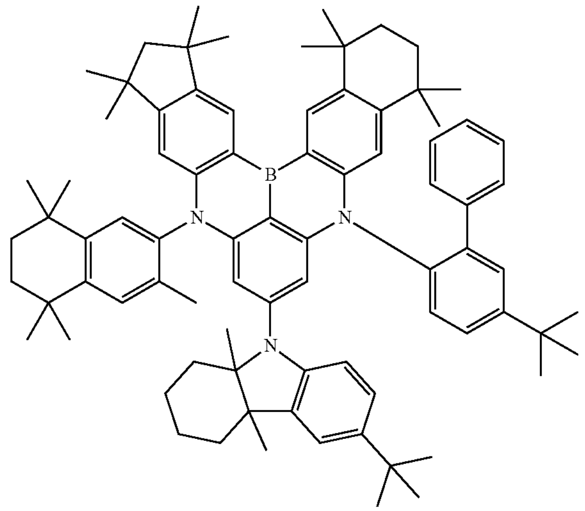
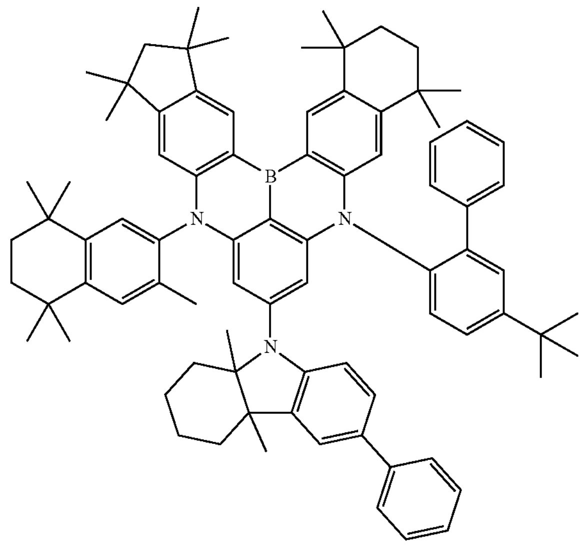
-continued
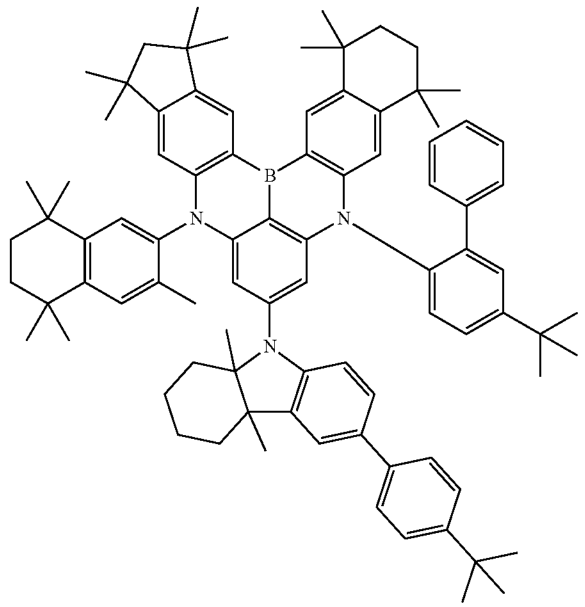
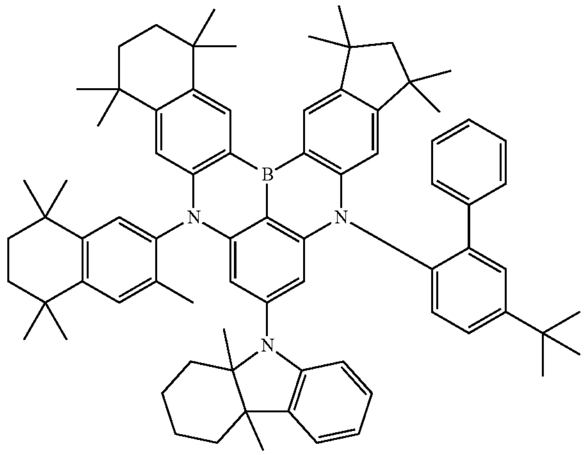
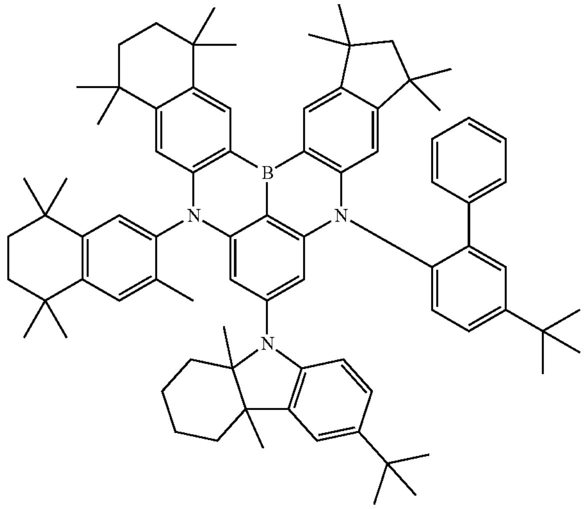

-continued
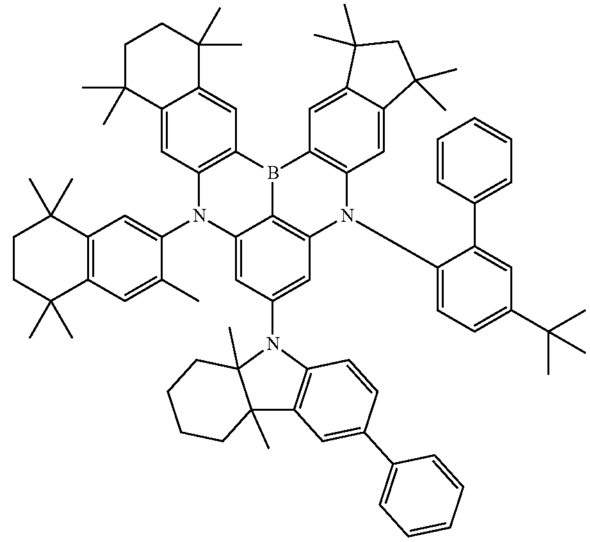
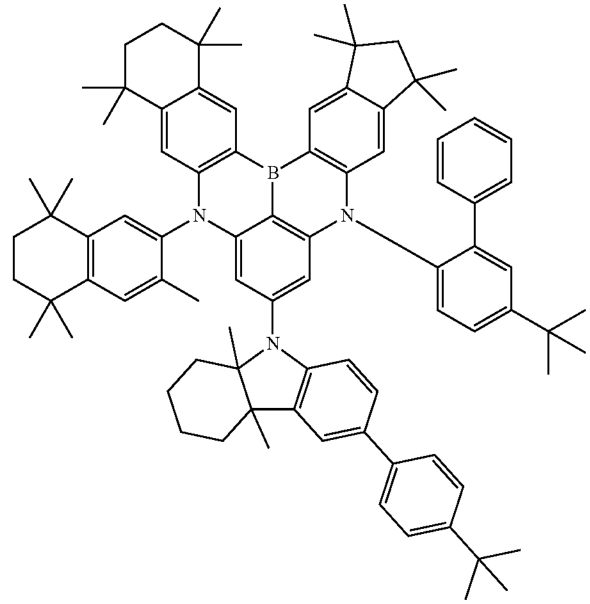
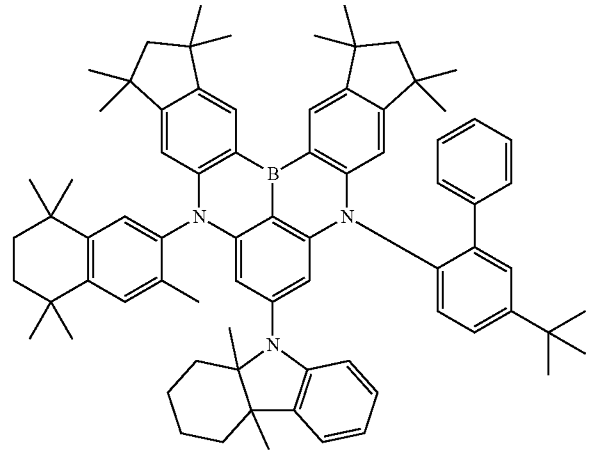
-continued
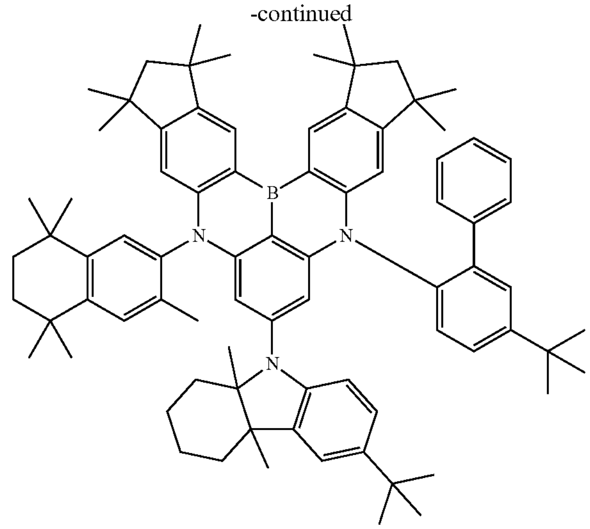
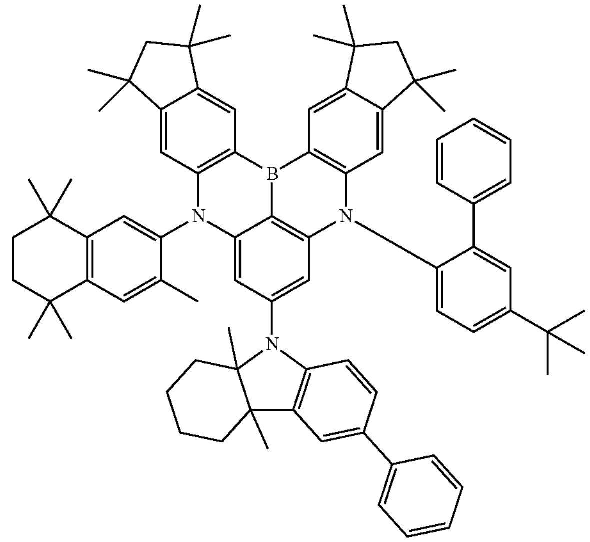
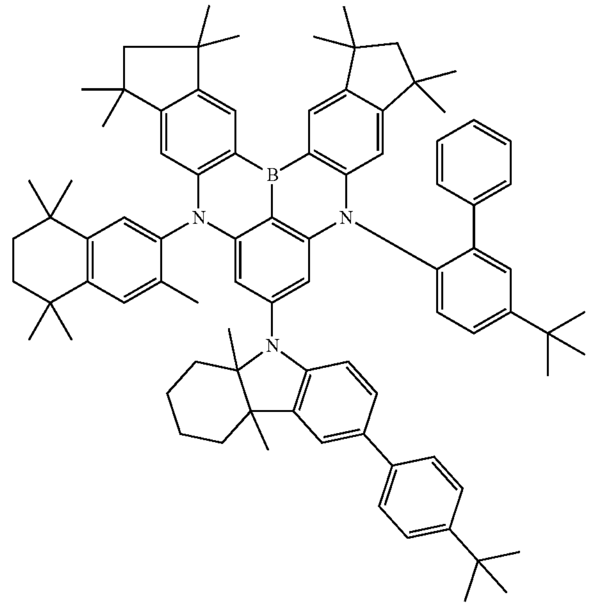

-continued
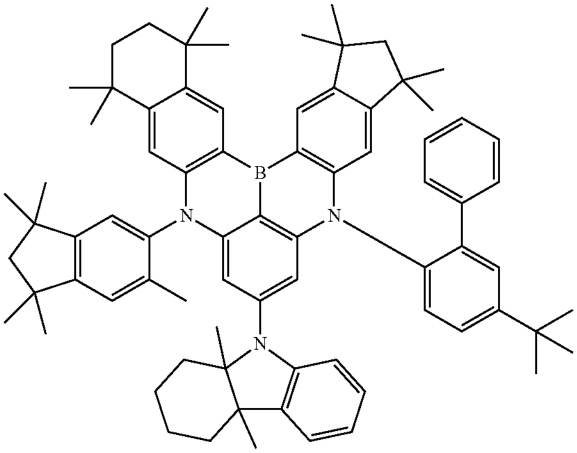
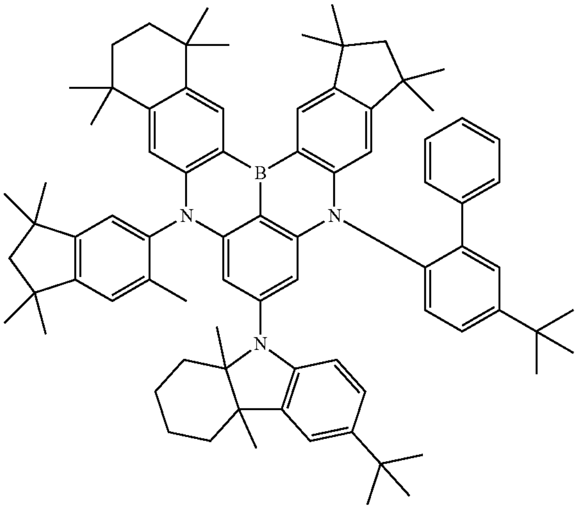
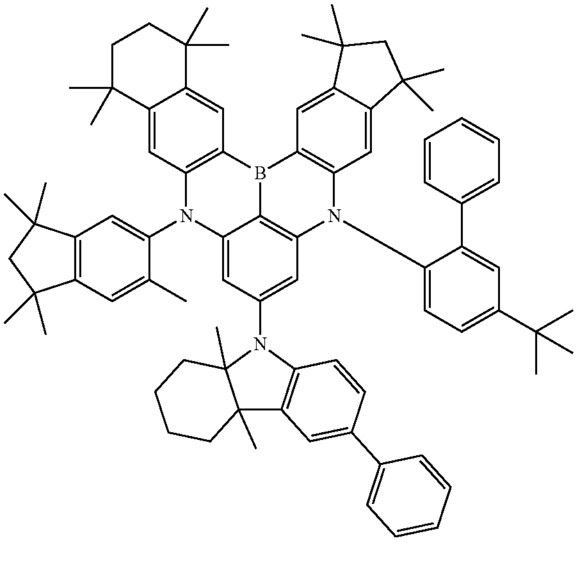
-continued
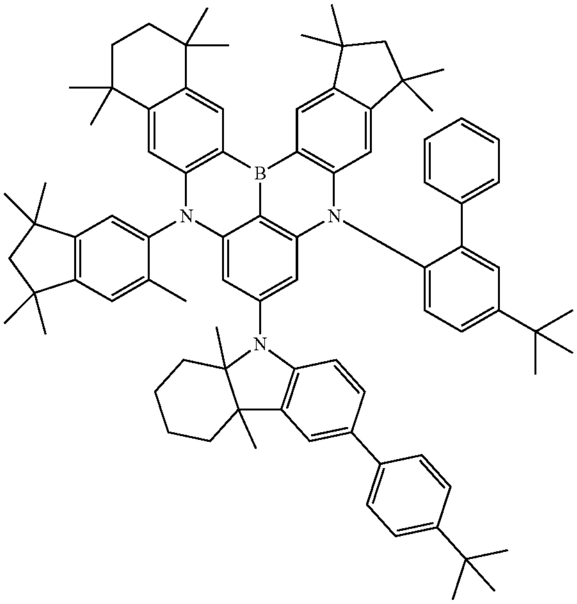
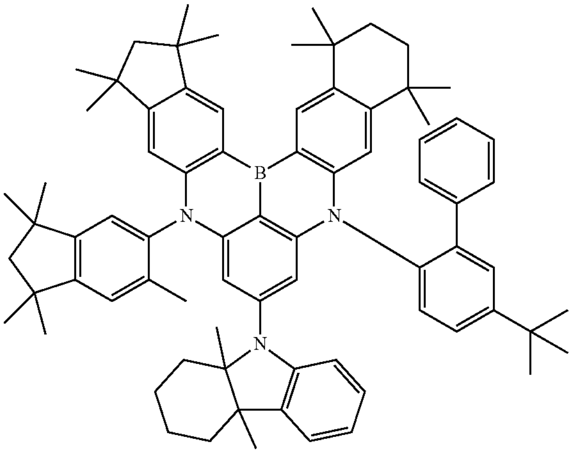
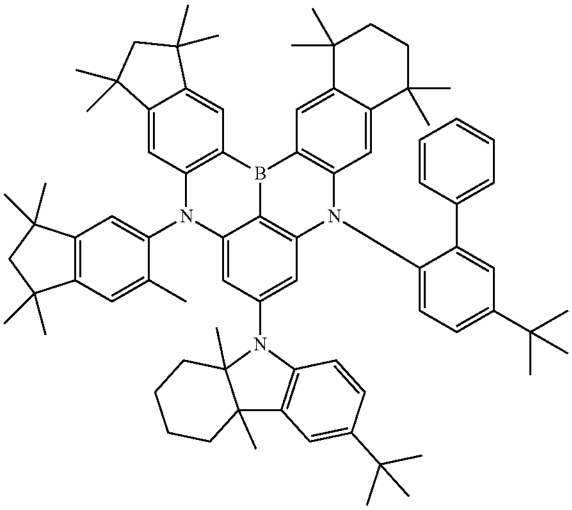

-continued
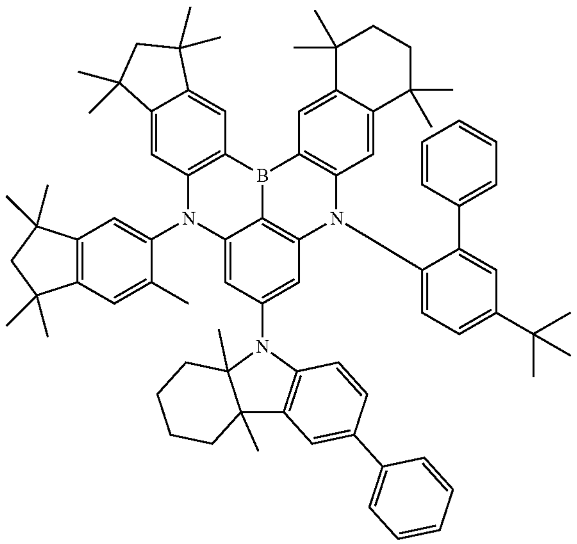
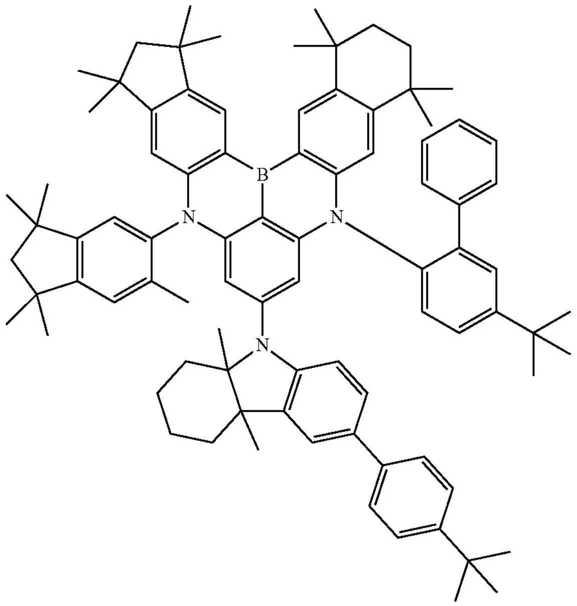
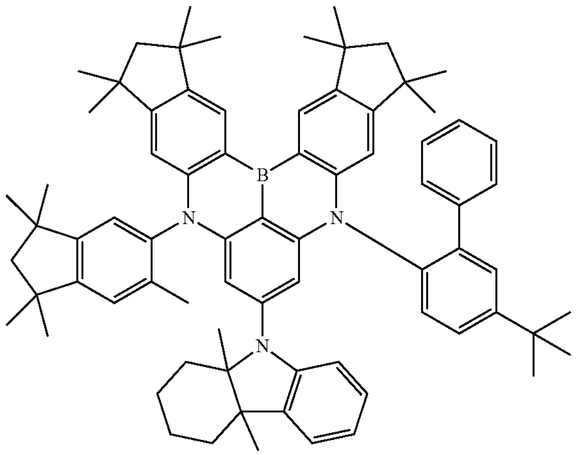
-continued
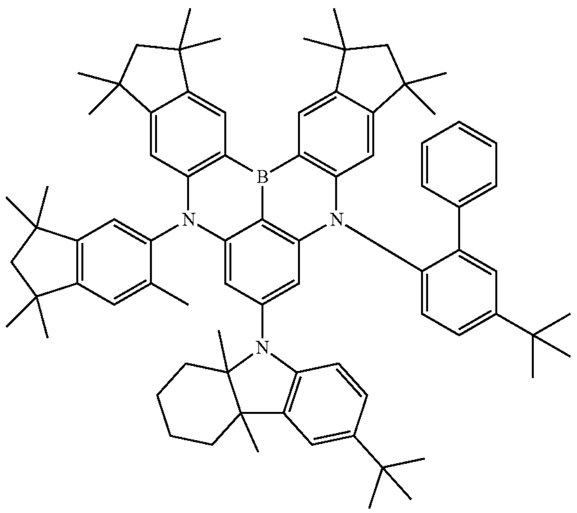
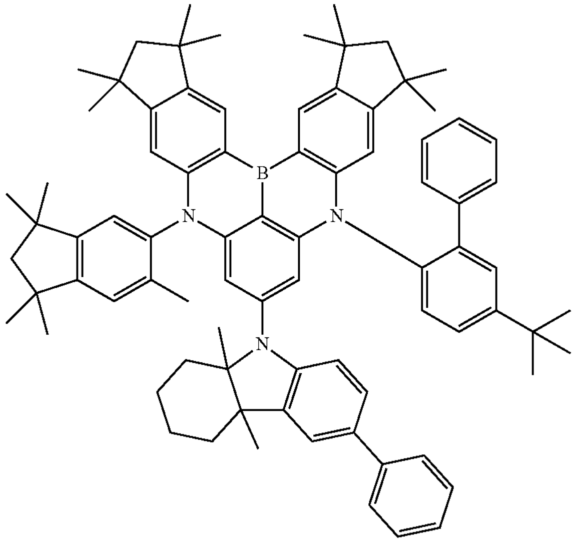
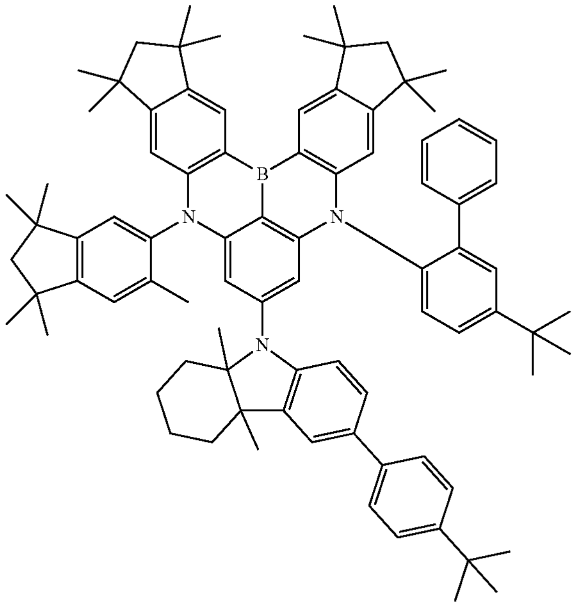

-continued
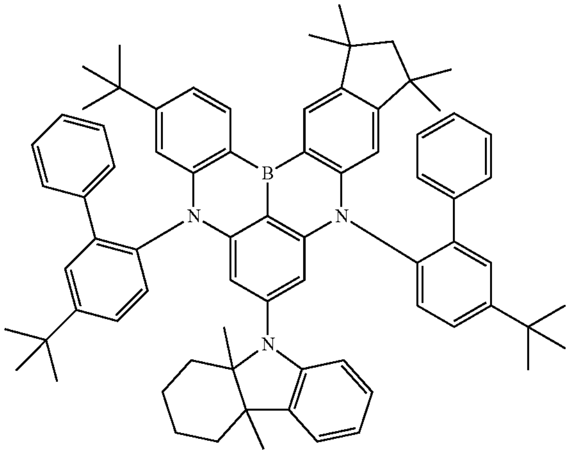
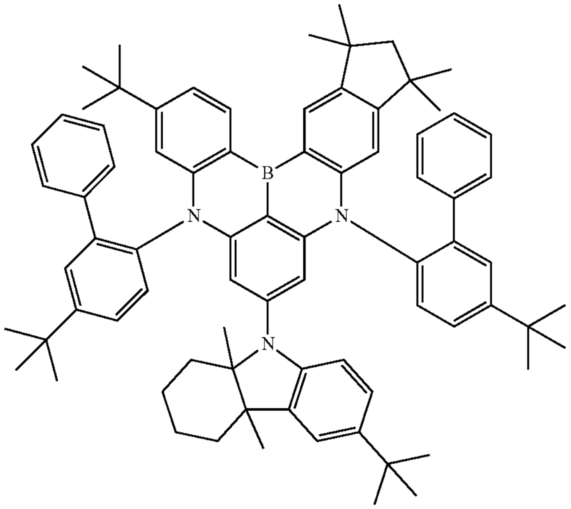
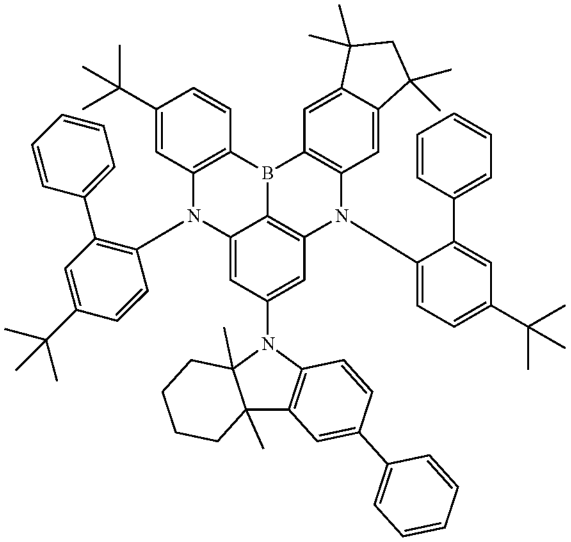
-continued
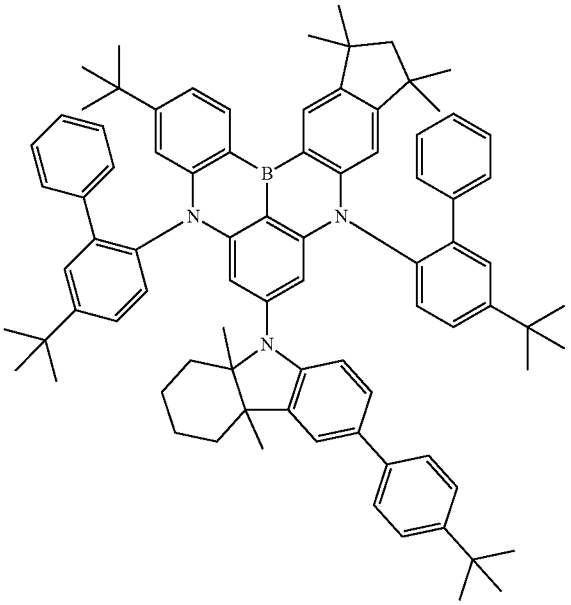
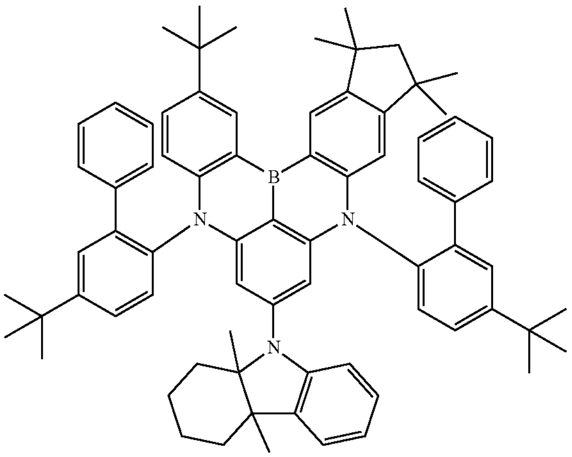
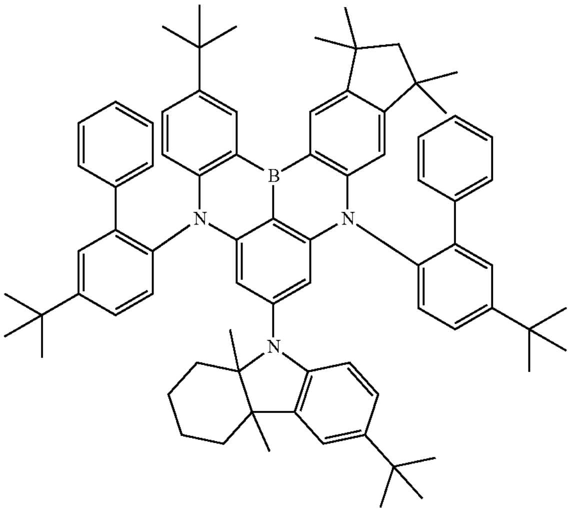

-continued
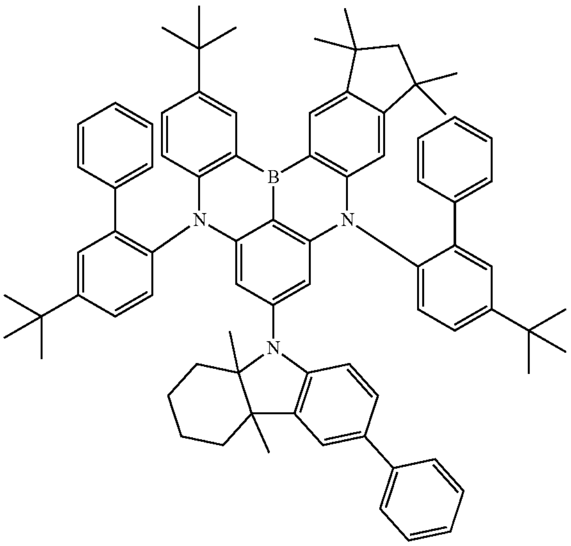
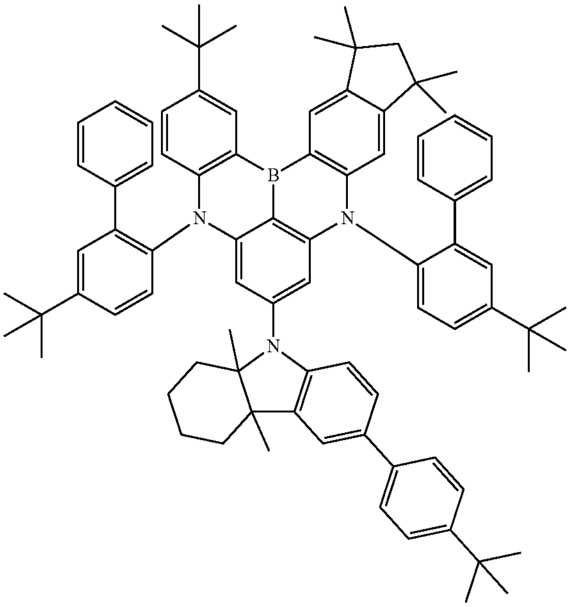
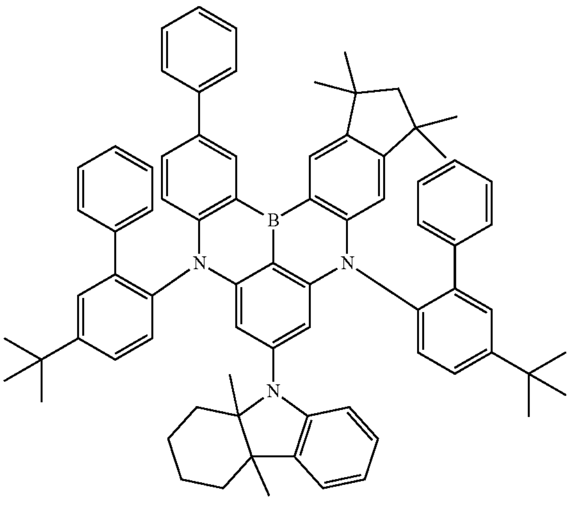
-continued
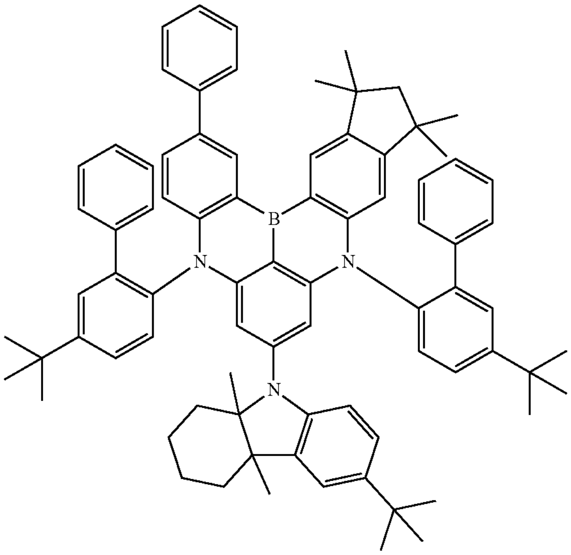
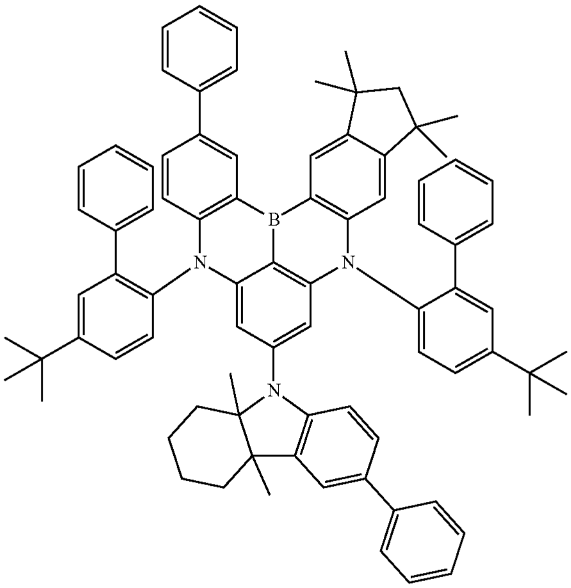

-continued
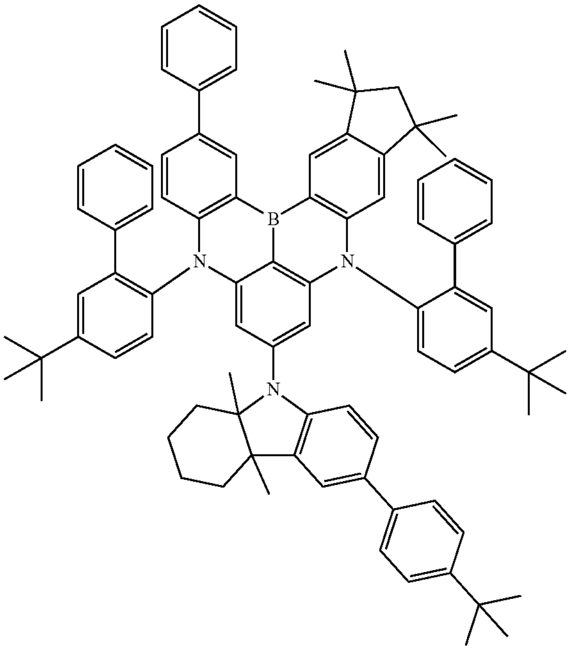
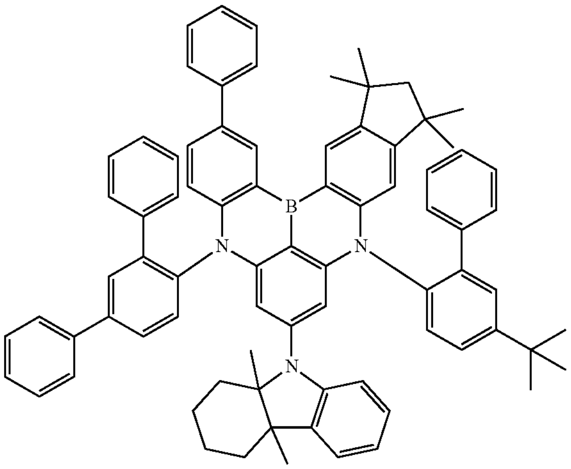
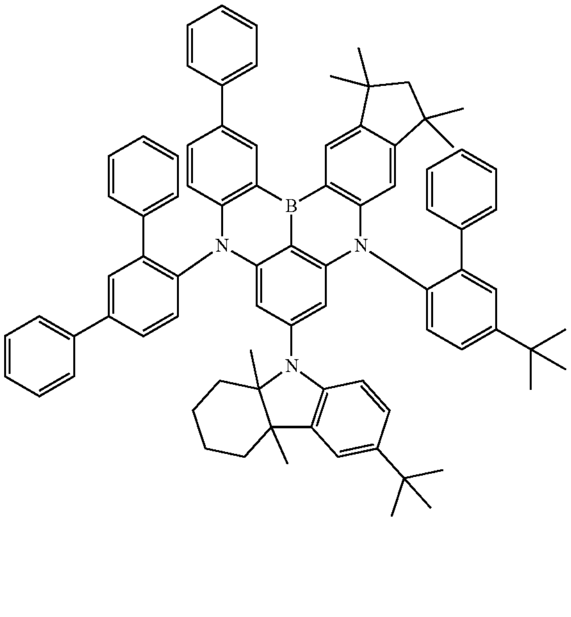
-continued
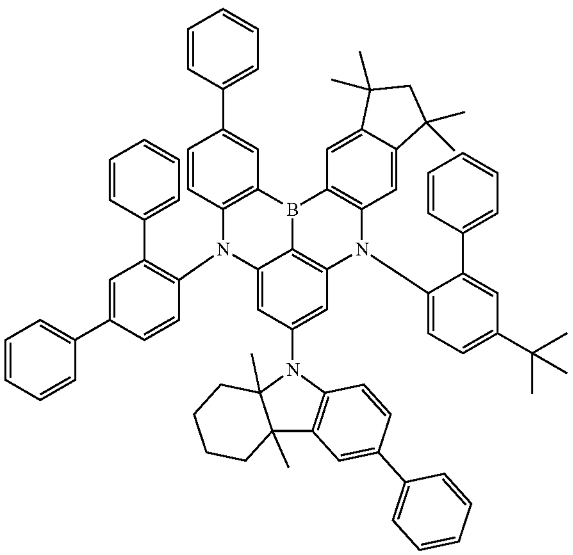
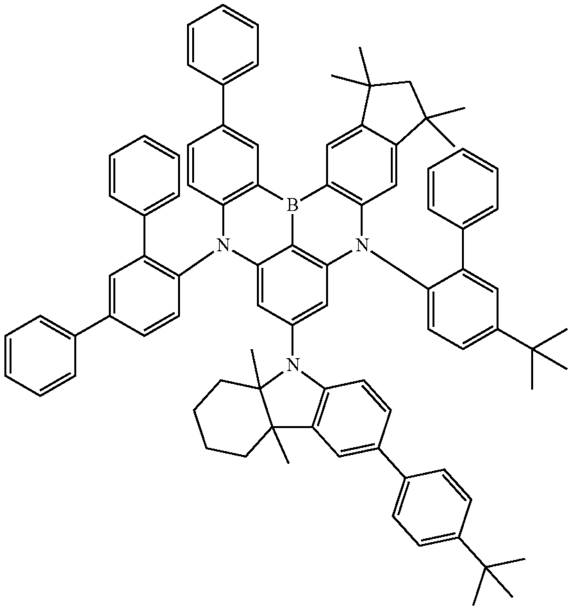
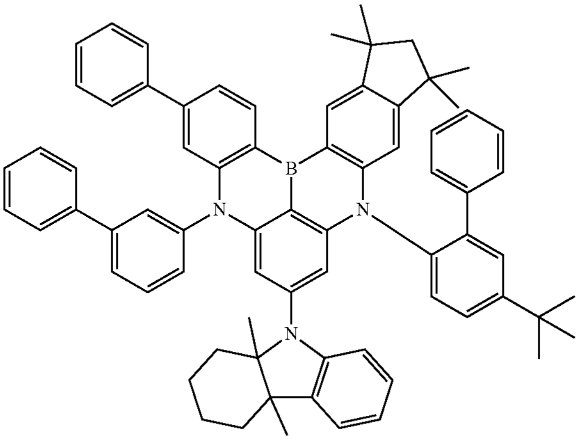

-continued
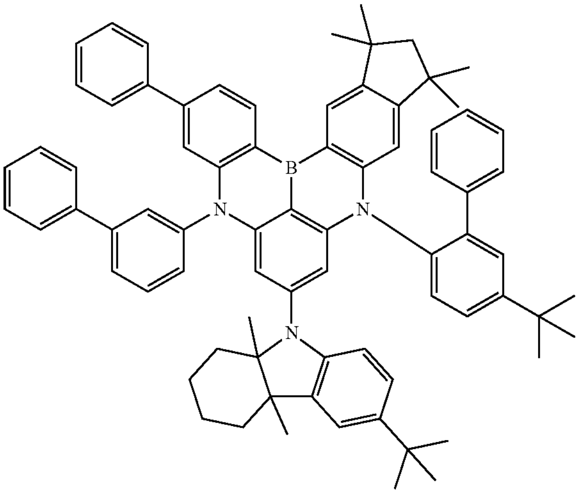
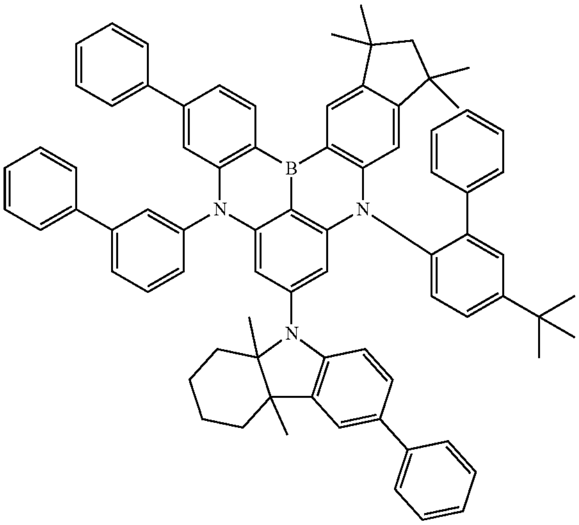
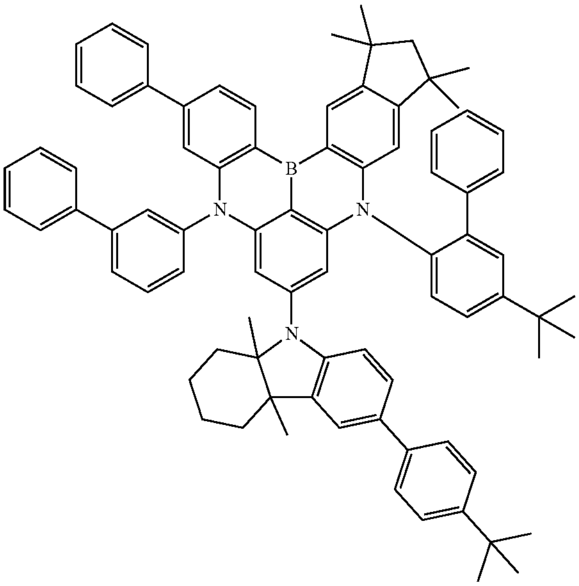
-continued
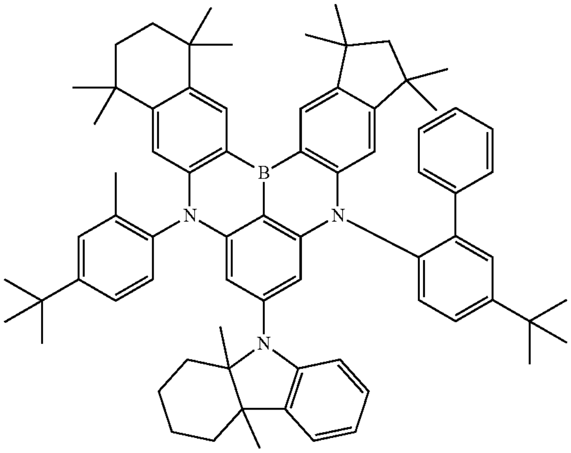
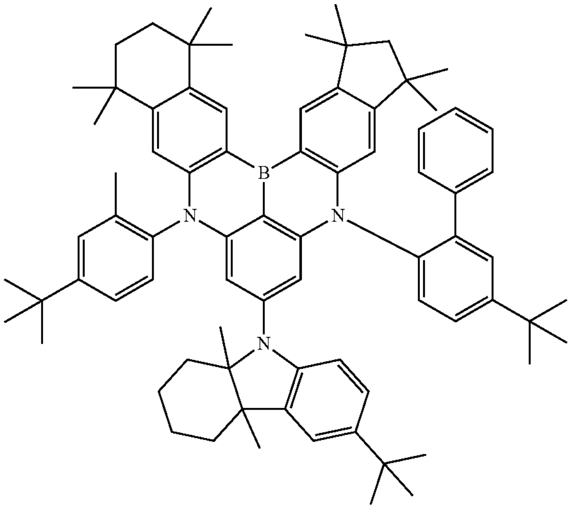
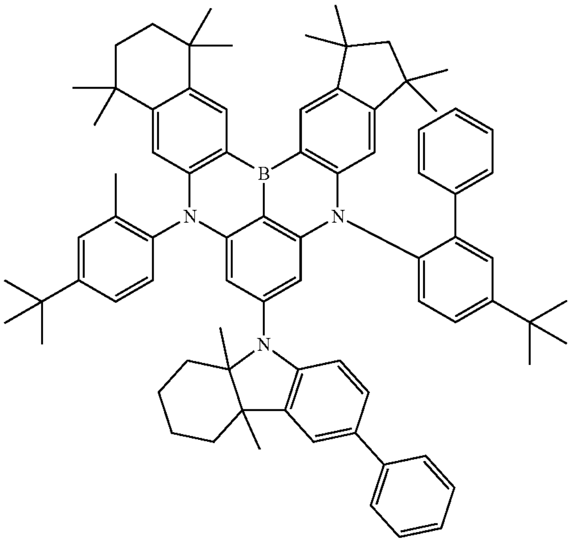

-continued
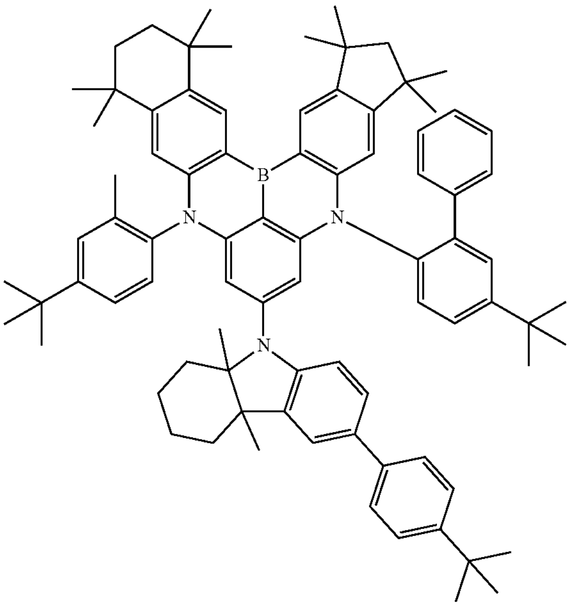
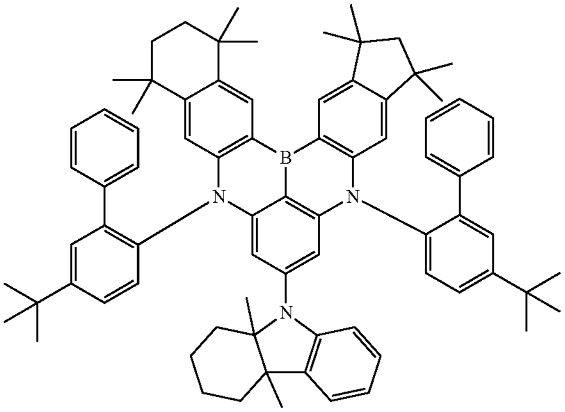
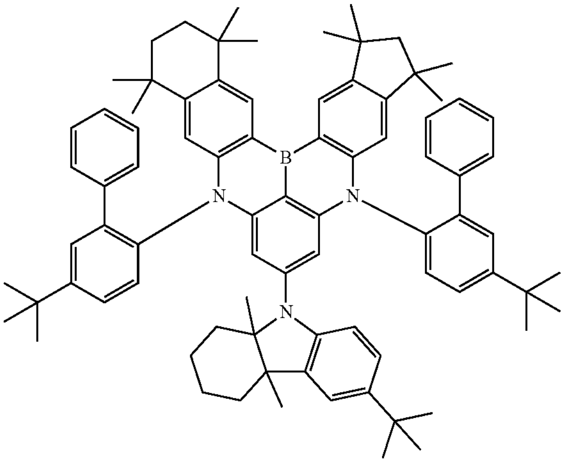
-continued
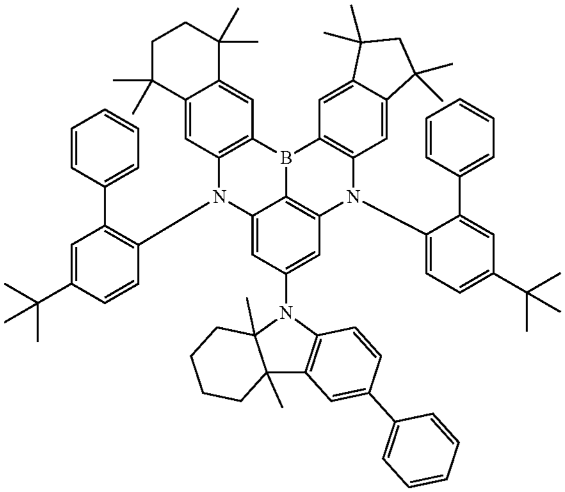
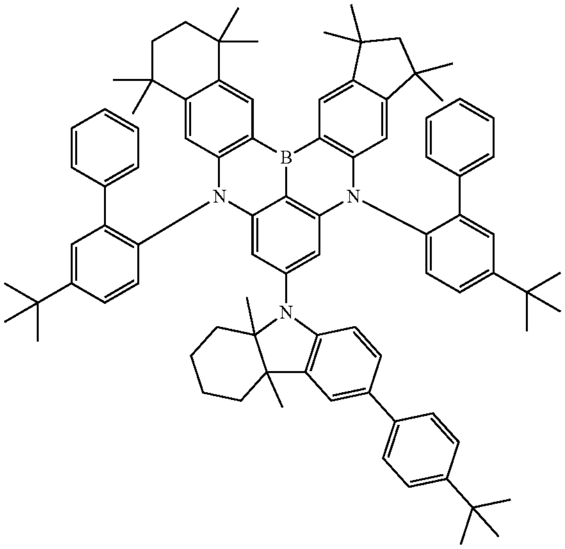
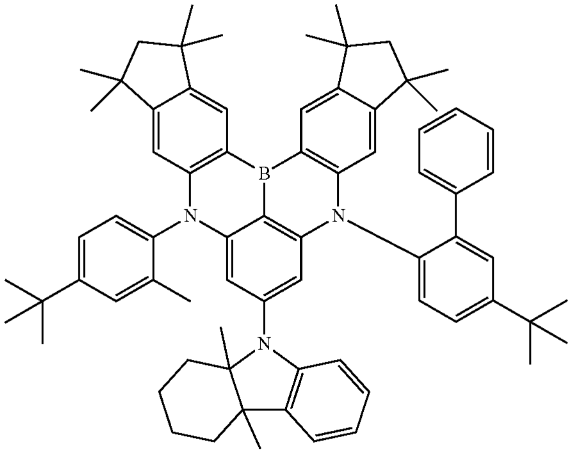

-continued
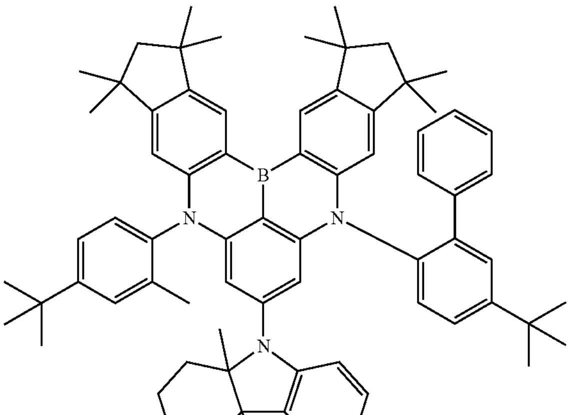
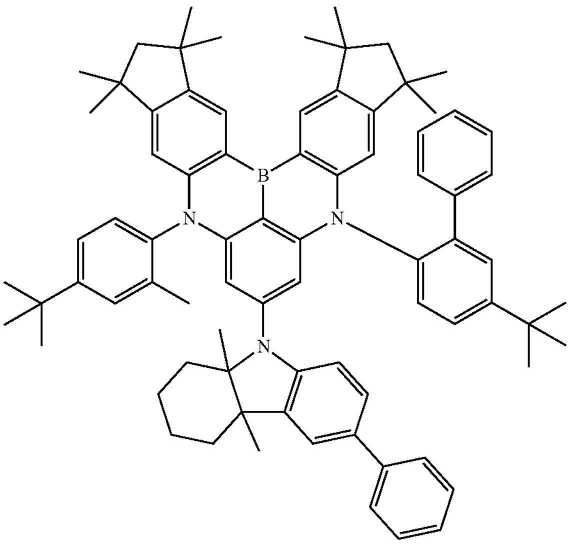
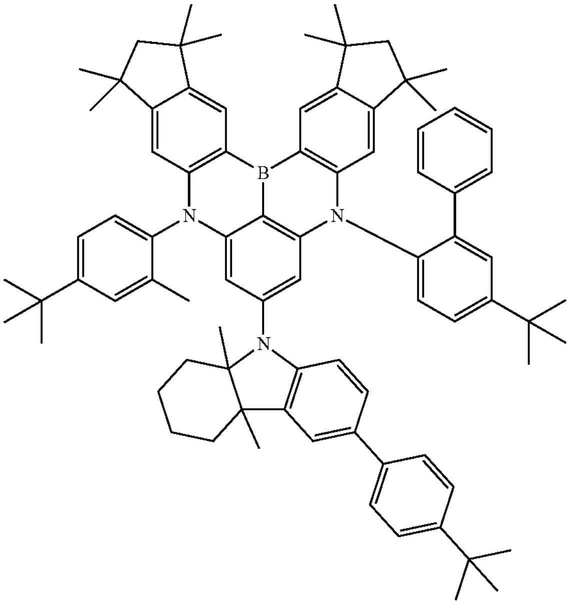
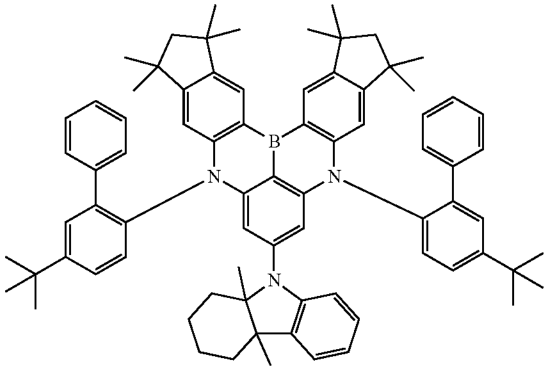
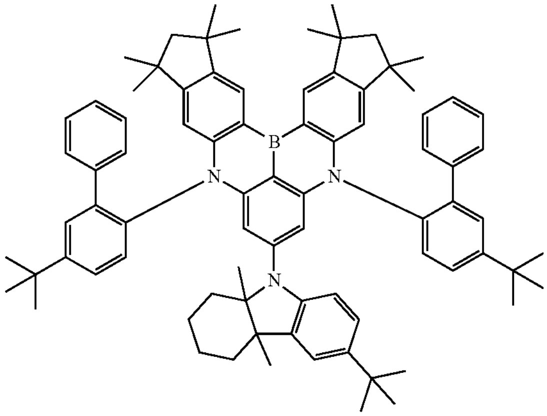
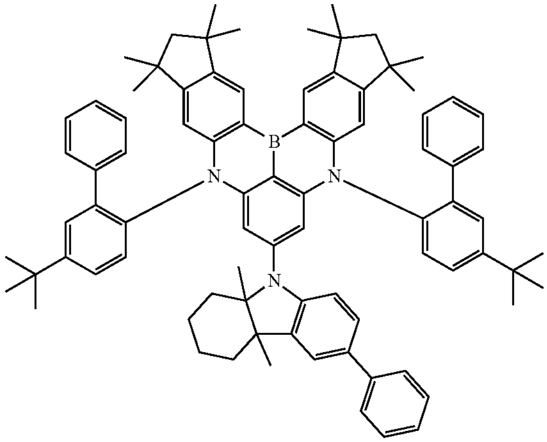
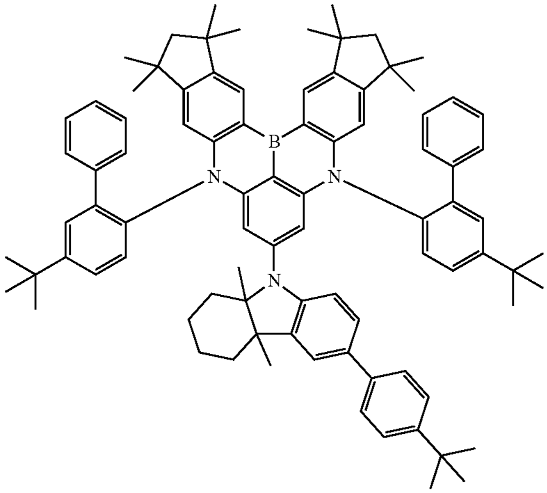

-continued
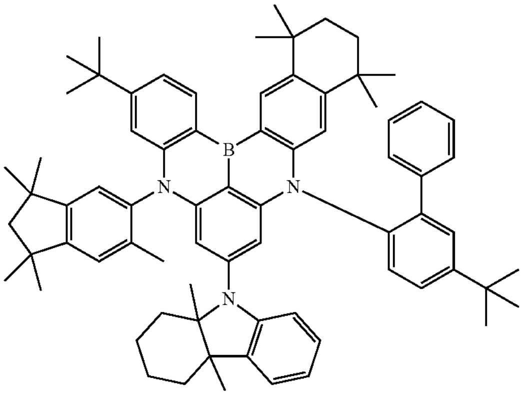
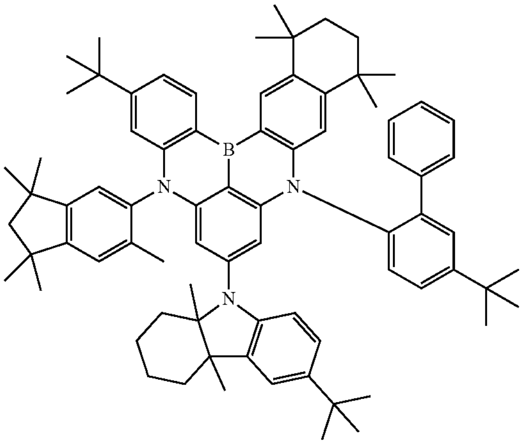
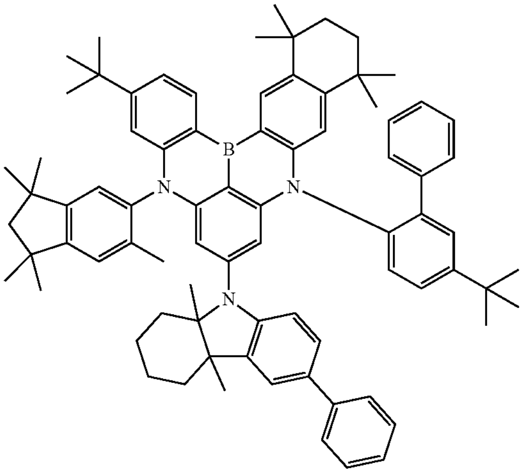
-continued
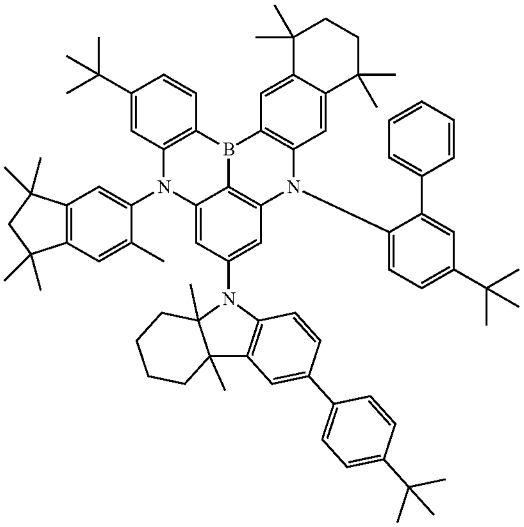
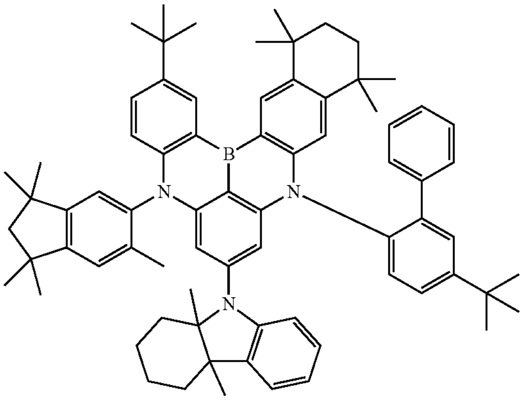
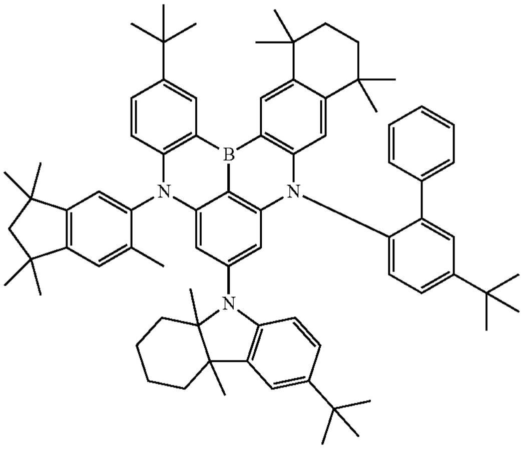

-continued
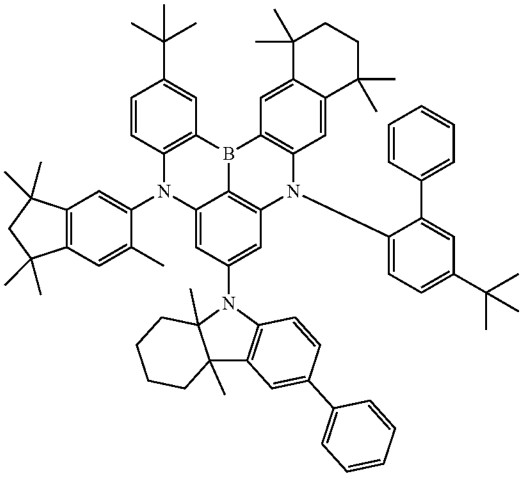
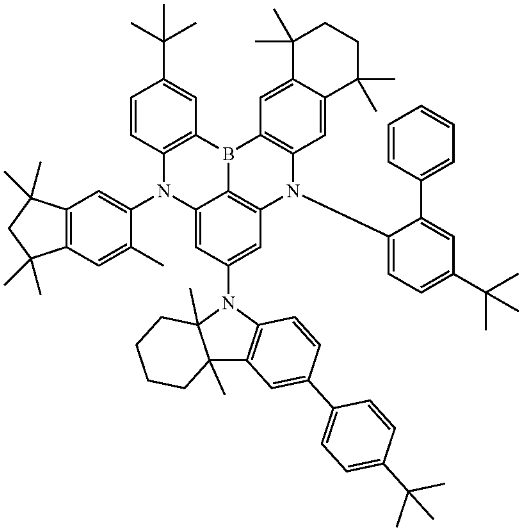
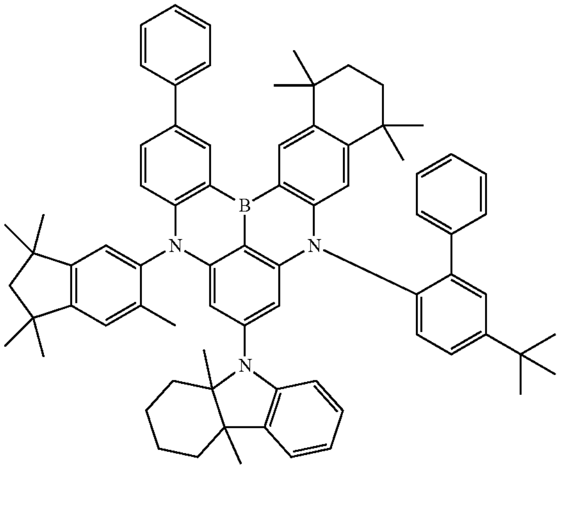
-continued
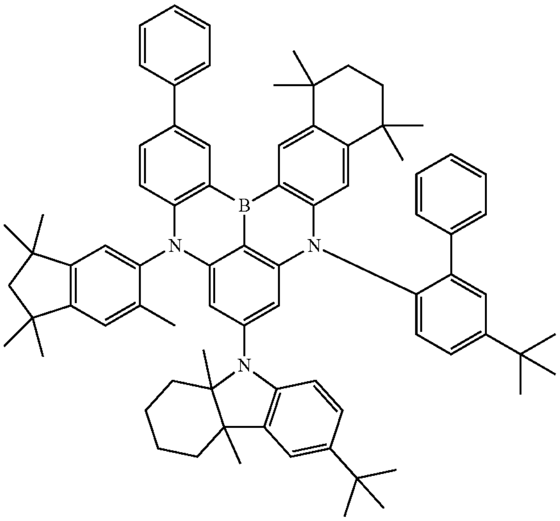
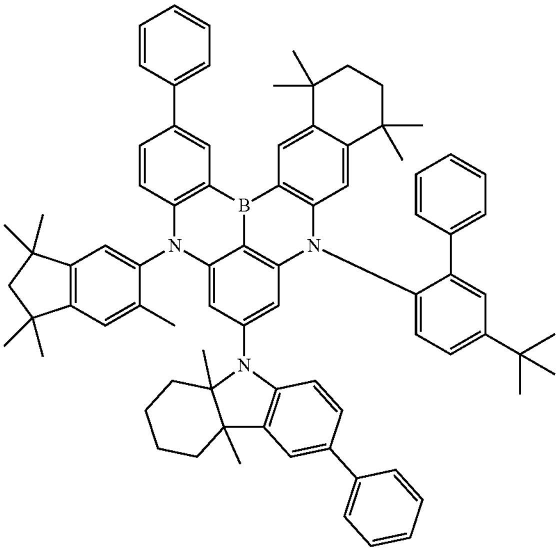
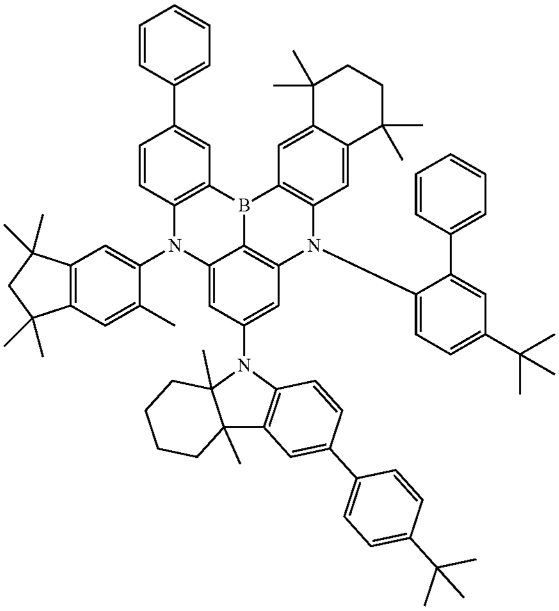

-continued
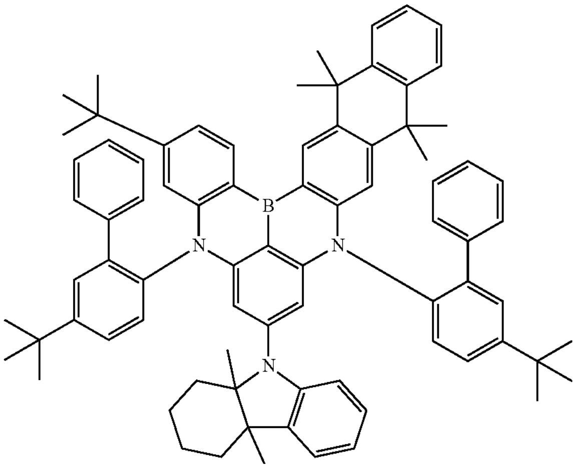
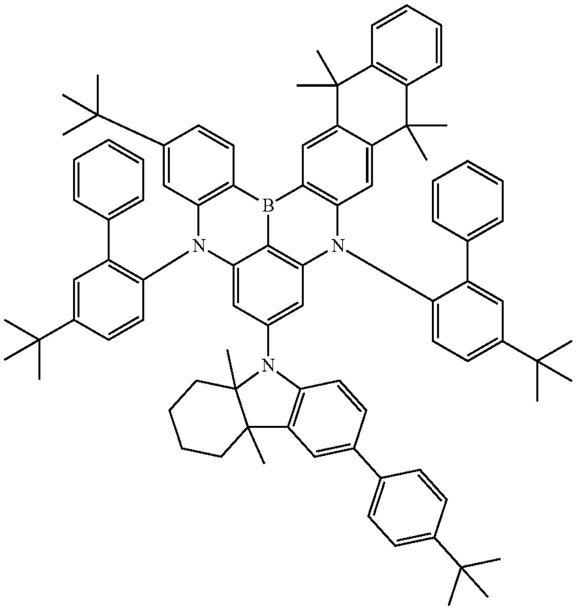
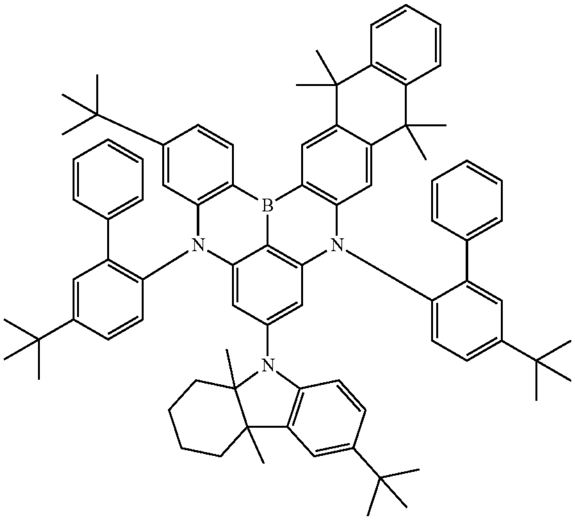
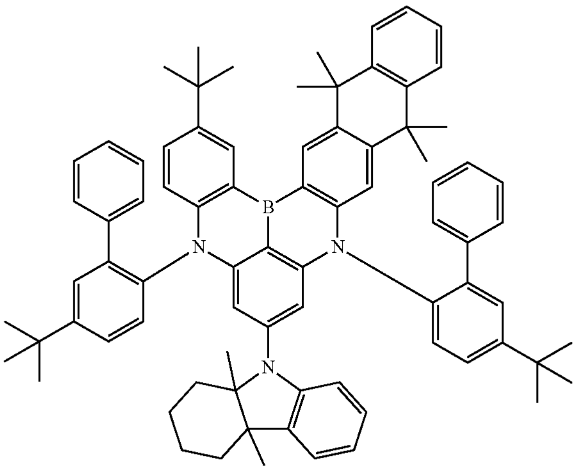
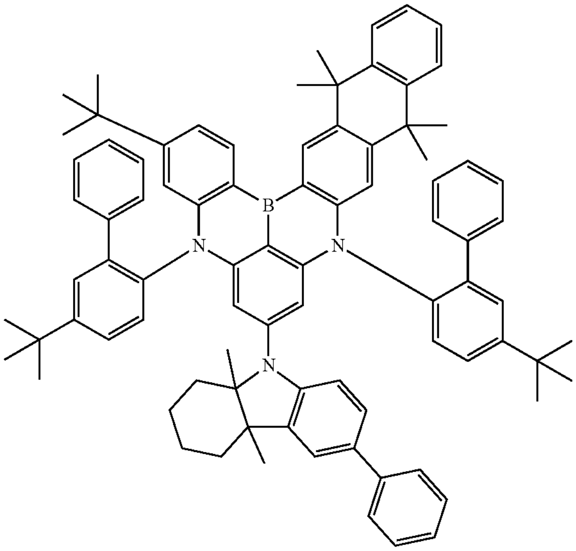
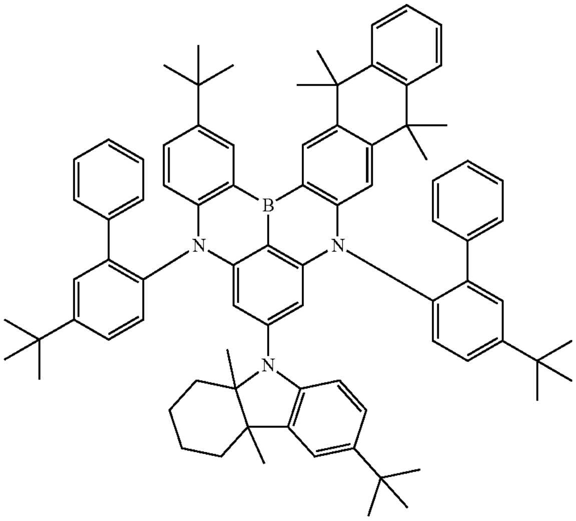

-continued
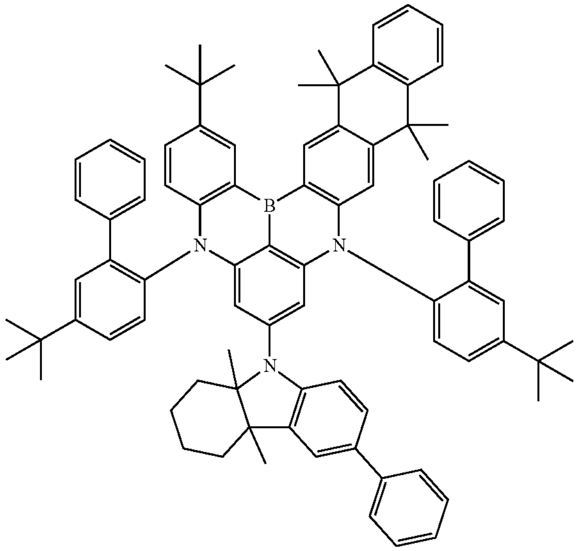
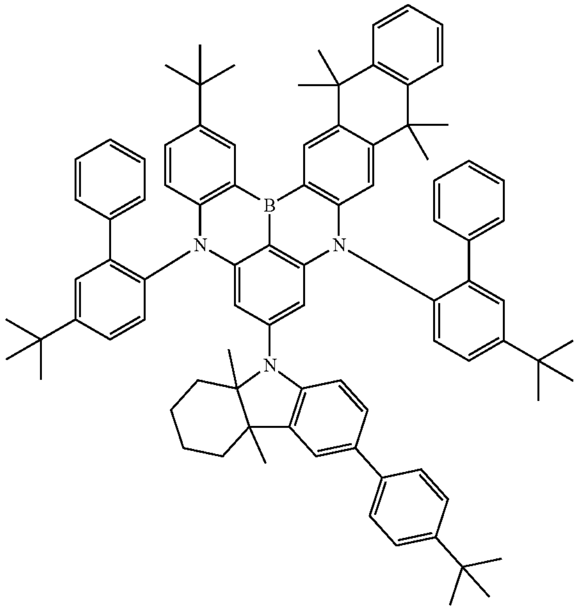
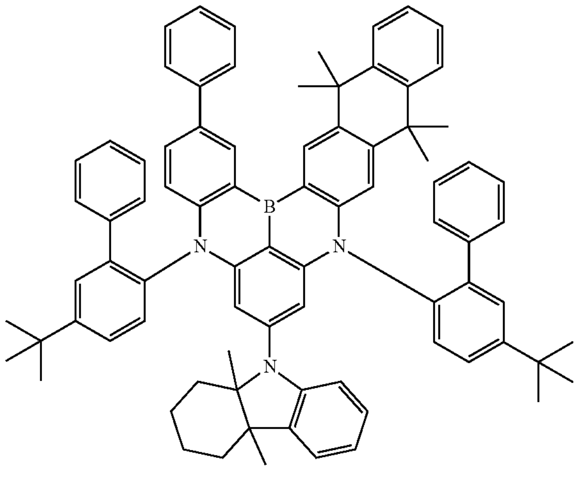
-continued
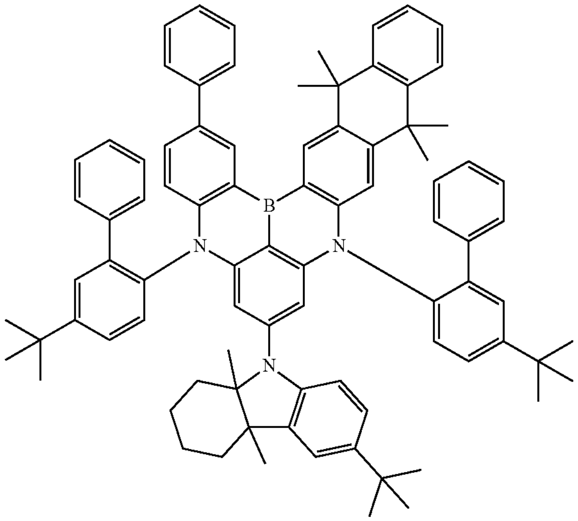
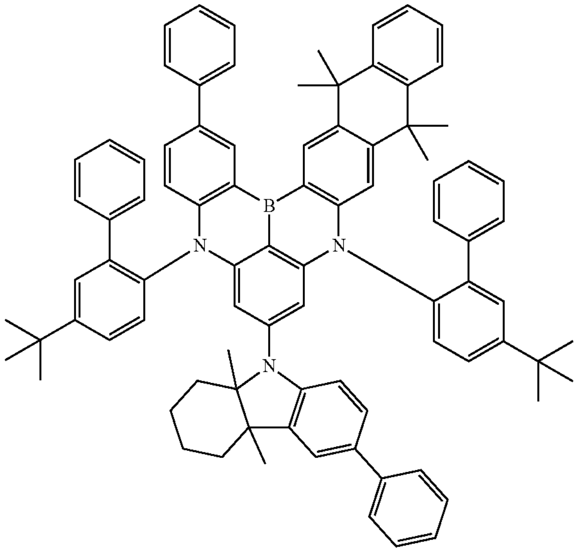
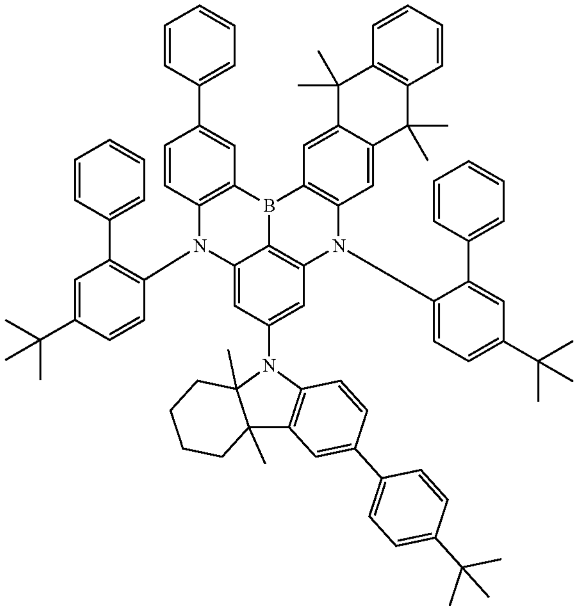

-continued
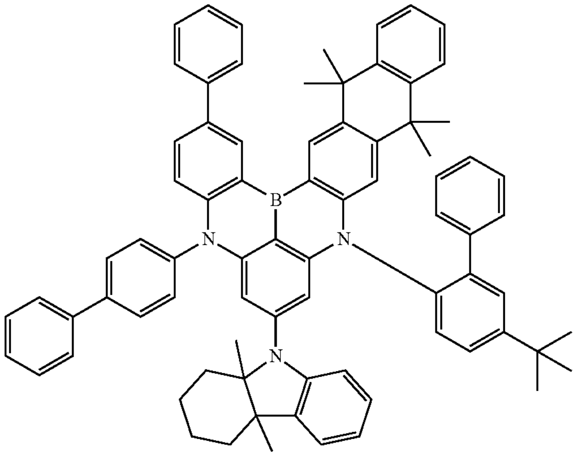
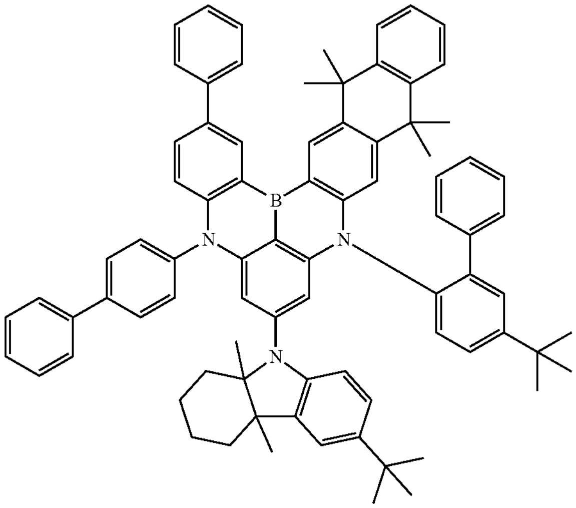
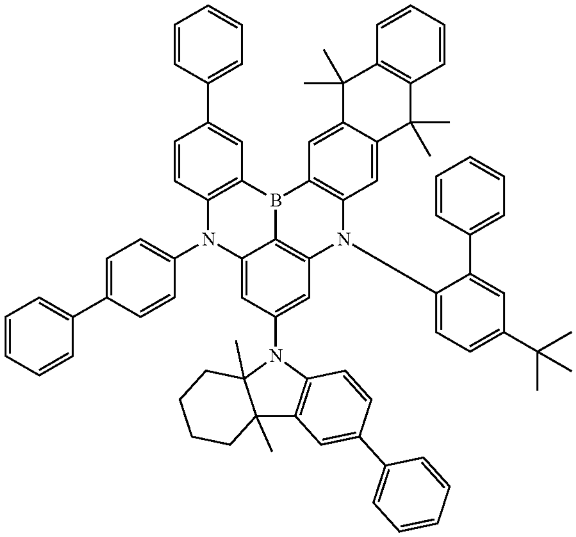
-continued
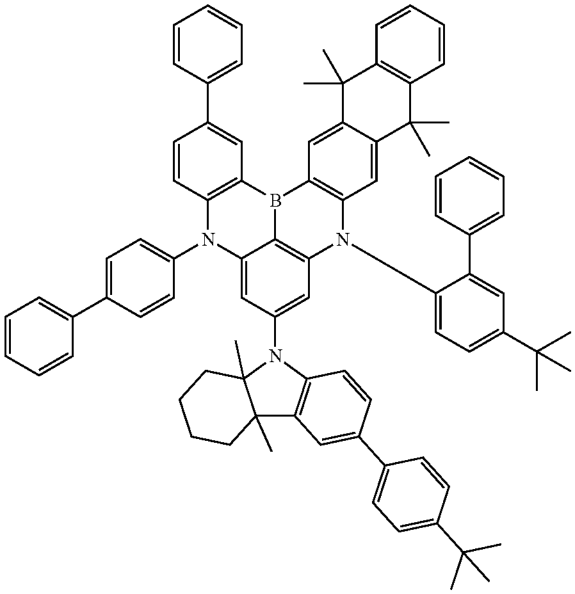
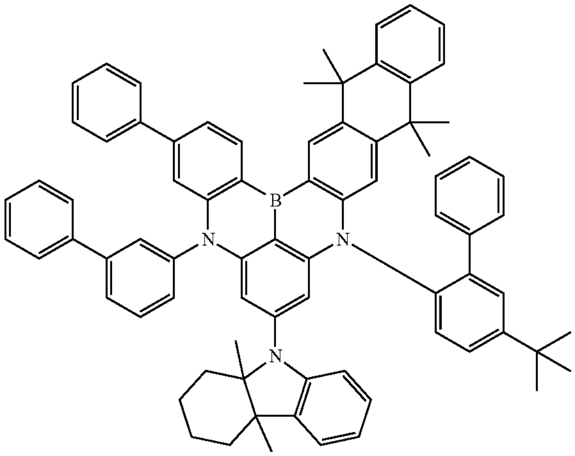
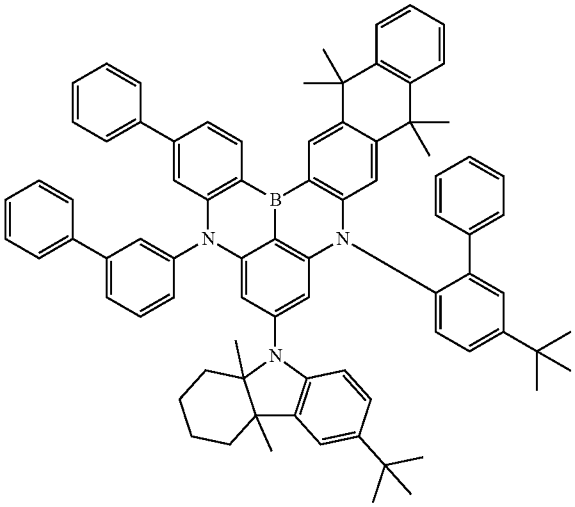

-continued
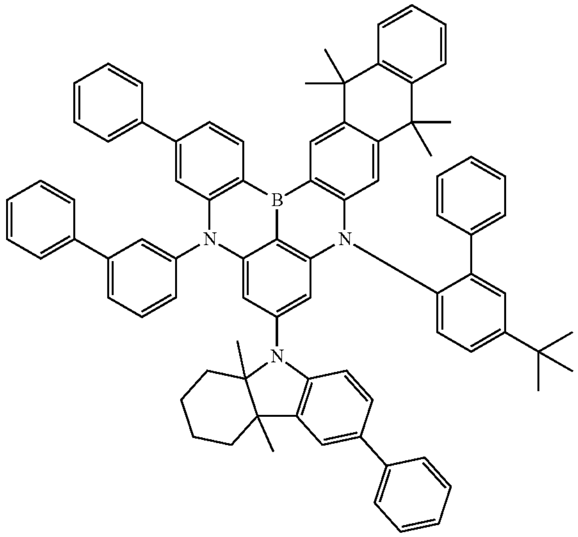
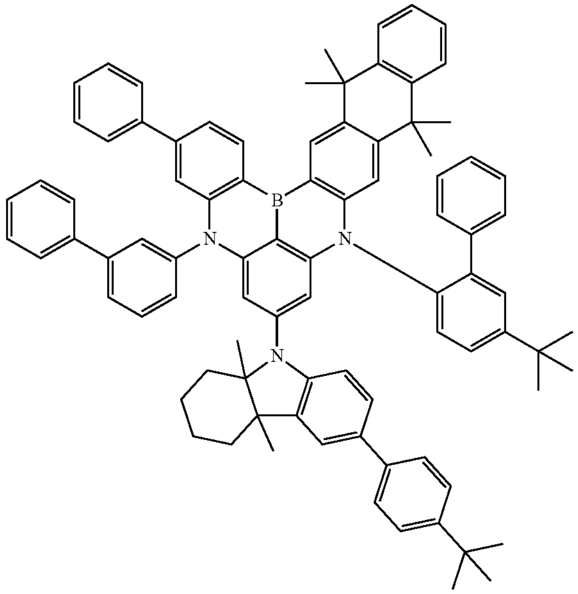
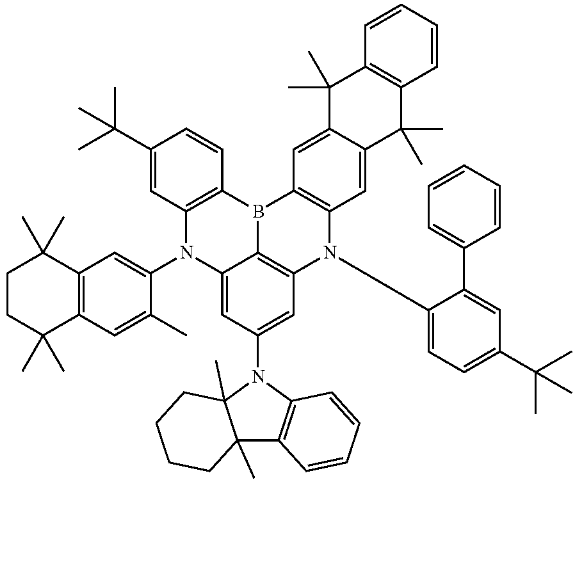
-continued
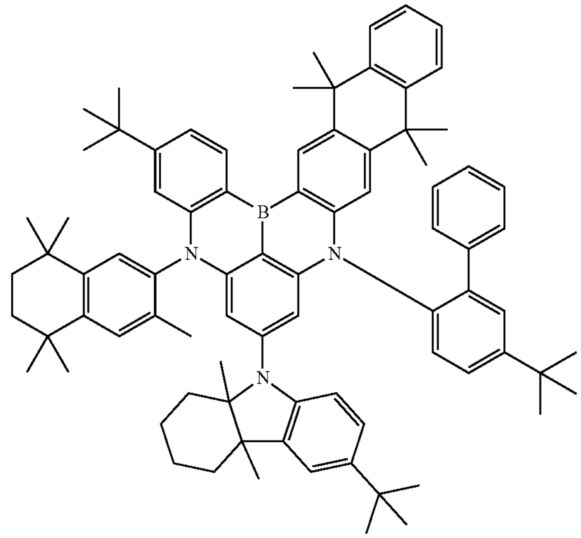
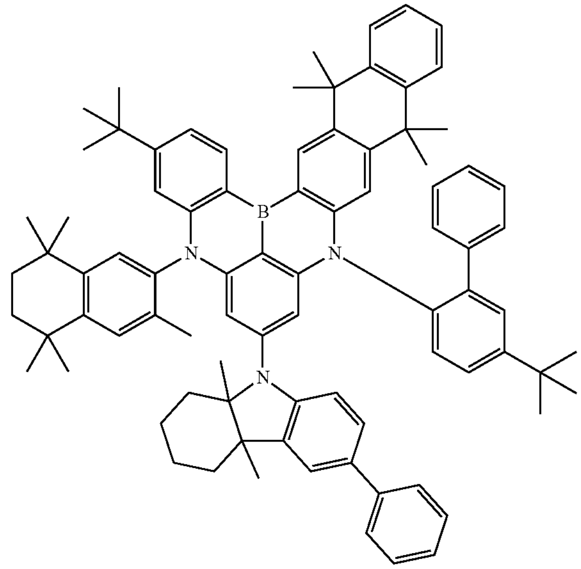

-continued
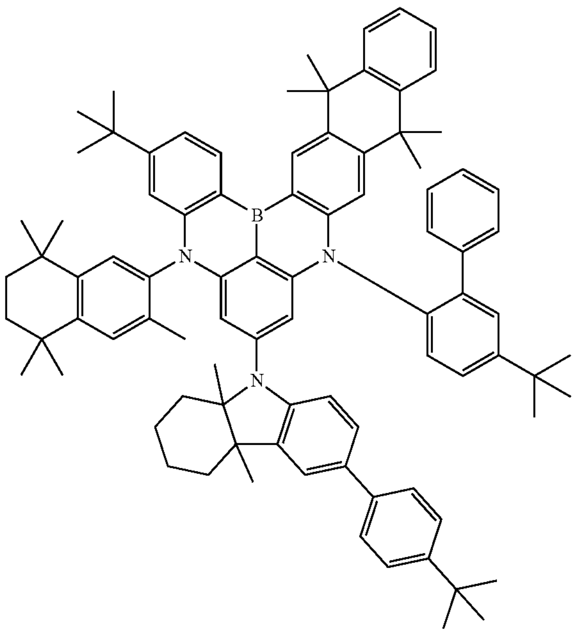
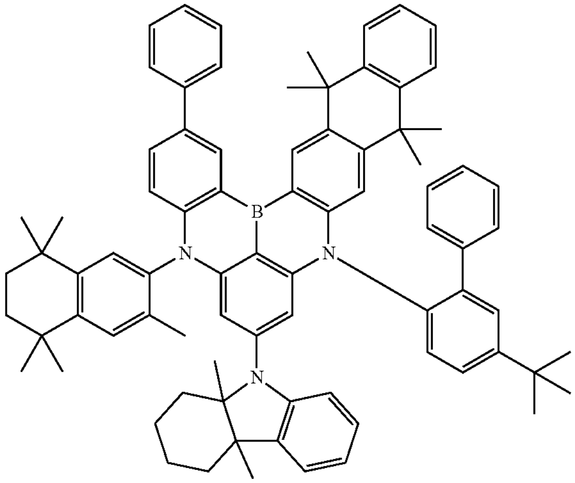
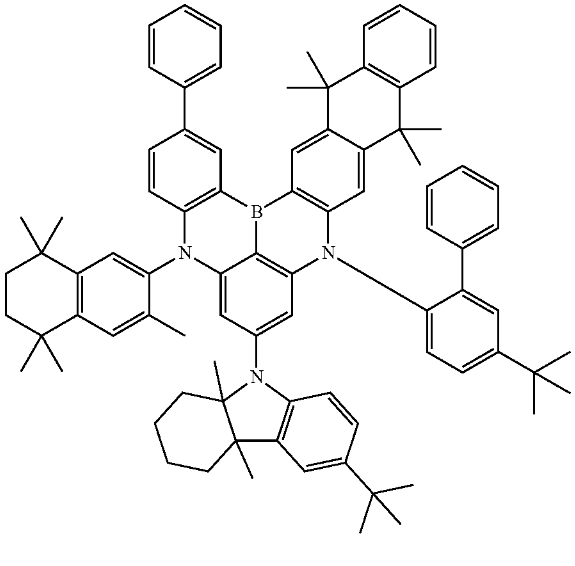
-continued
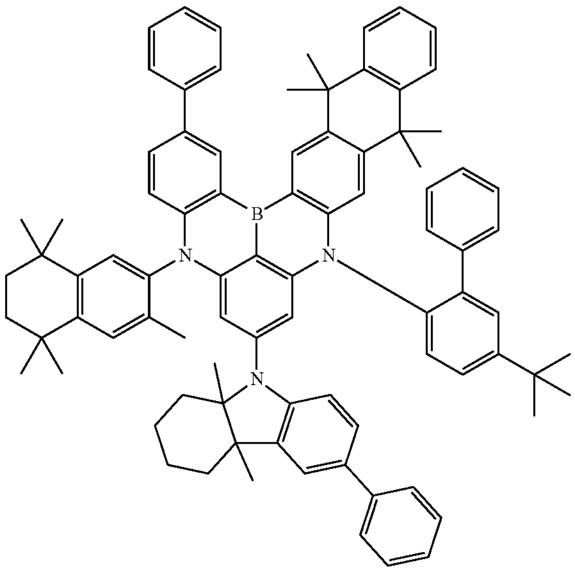
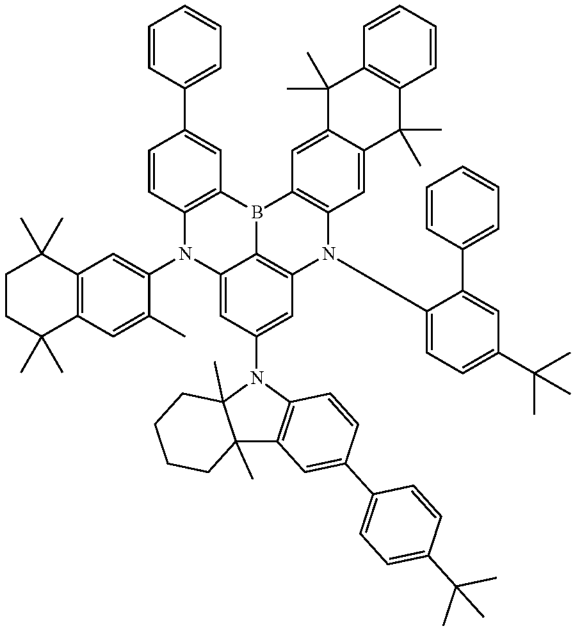
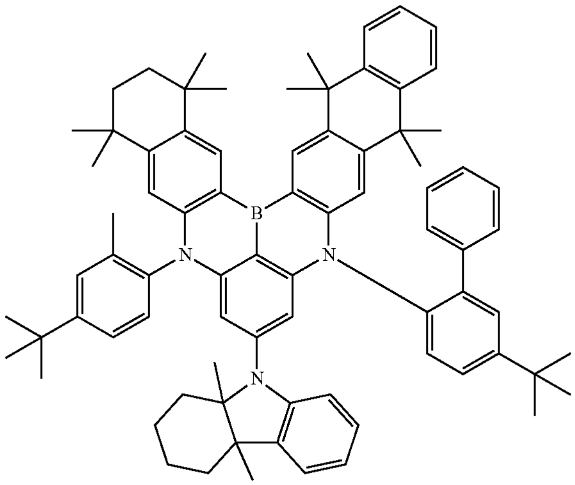

-continued
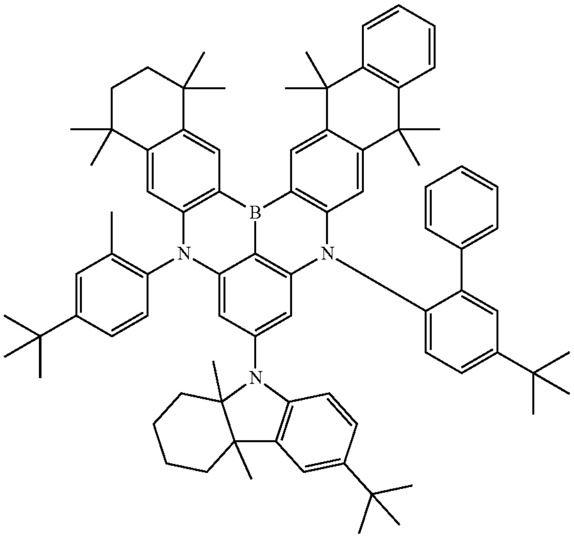
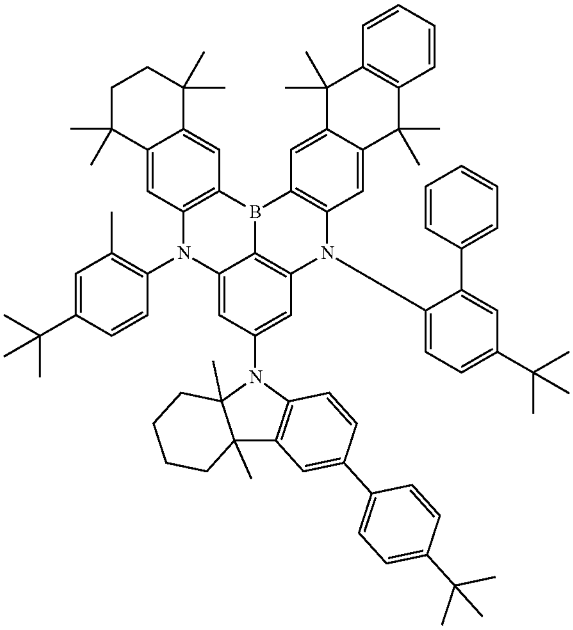
-continued
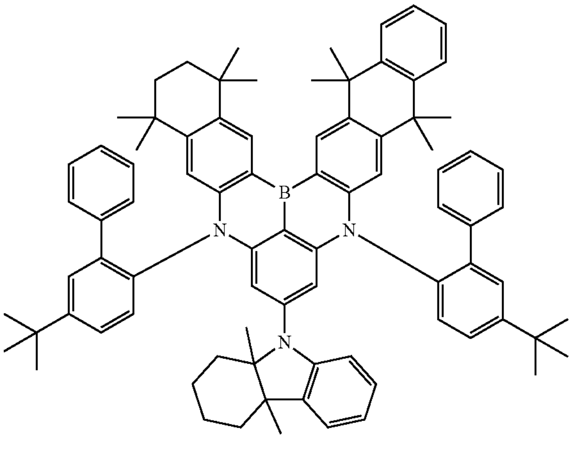
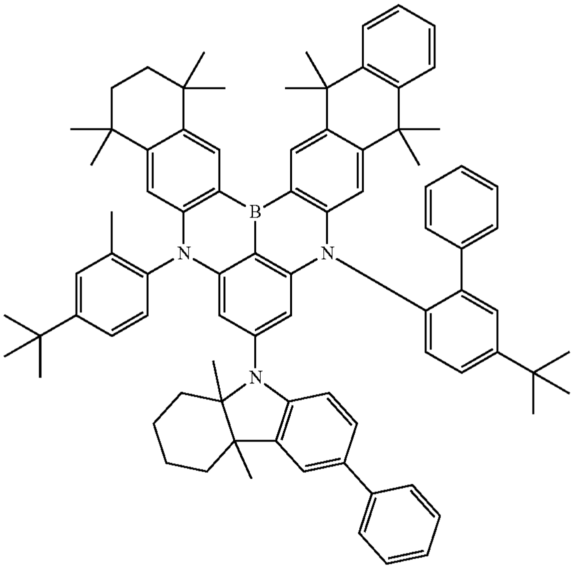
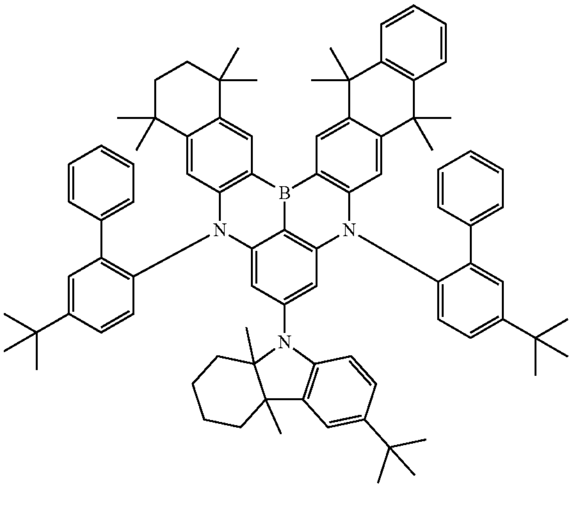

-continued
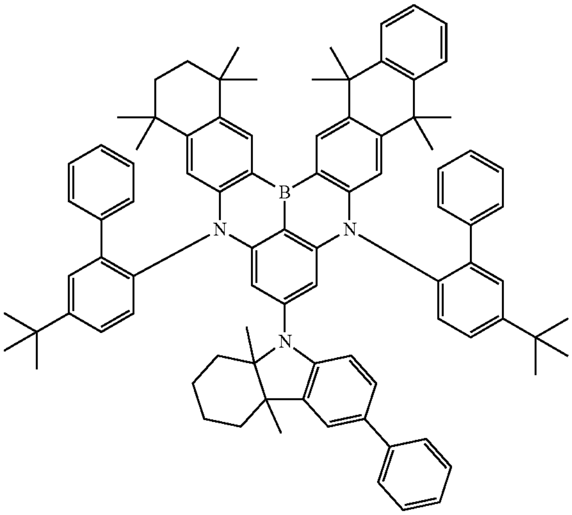
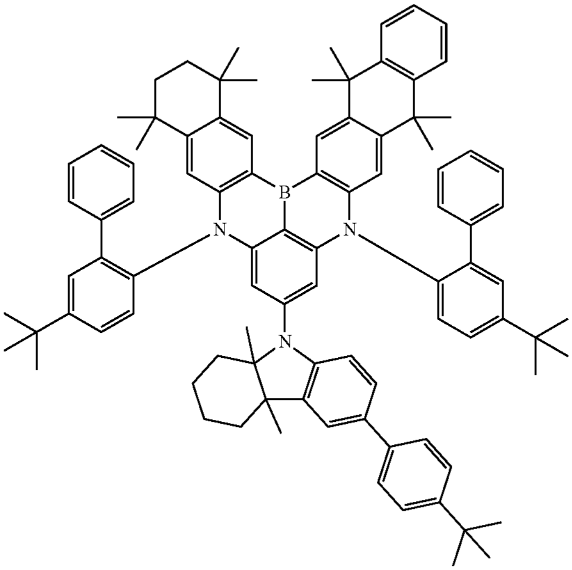
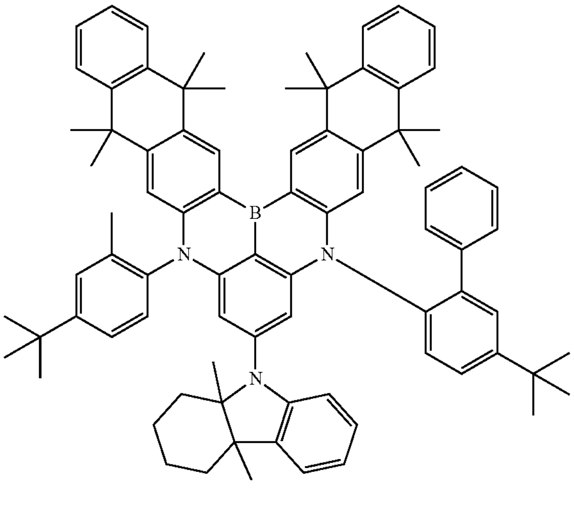
-continued
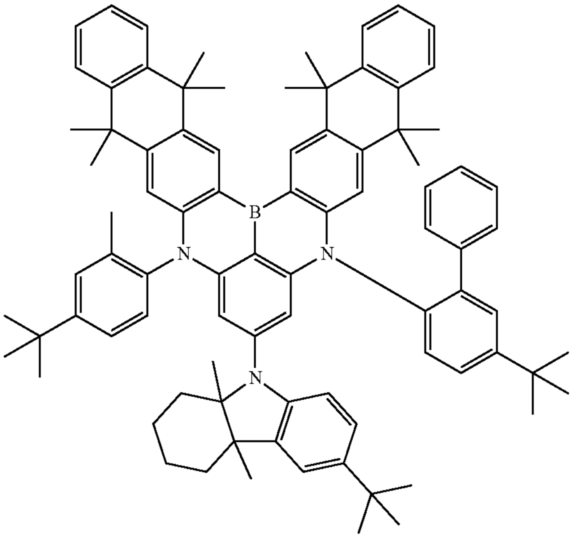
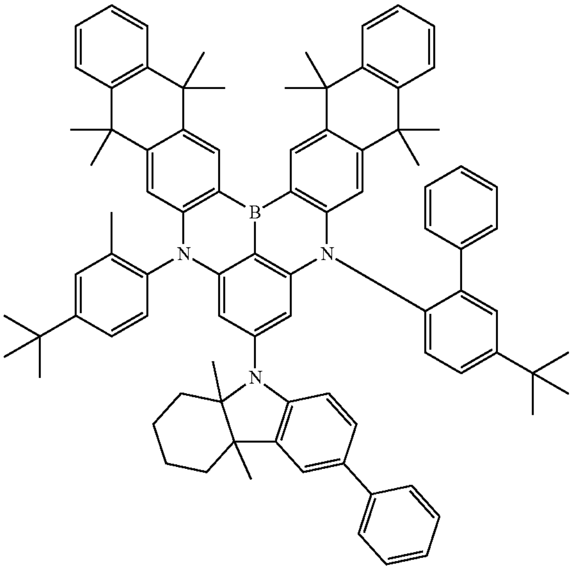

-continued
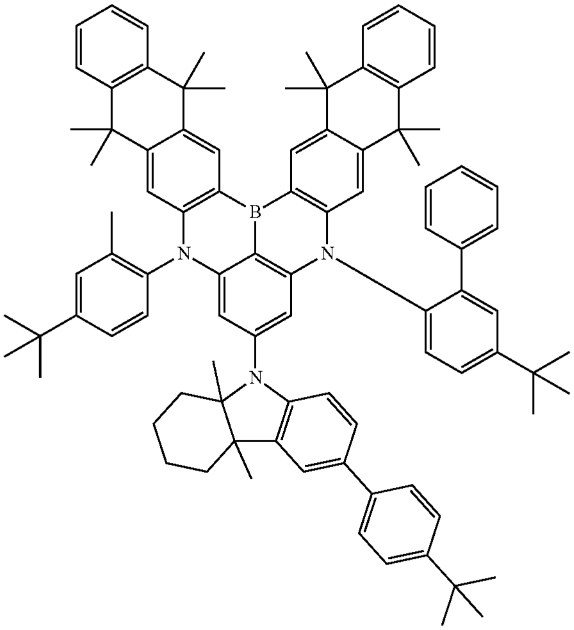
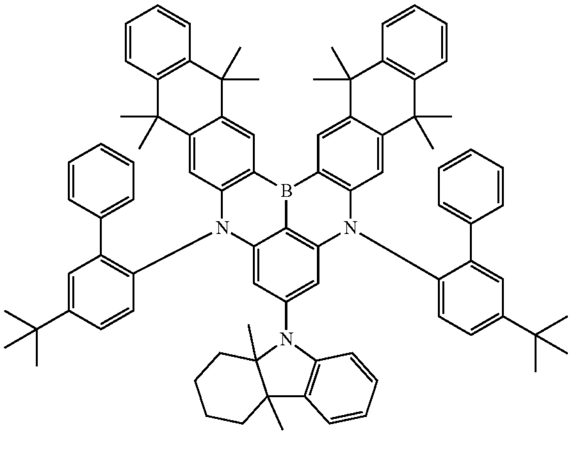
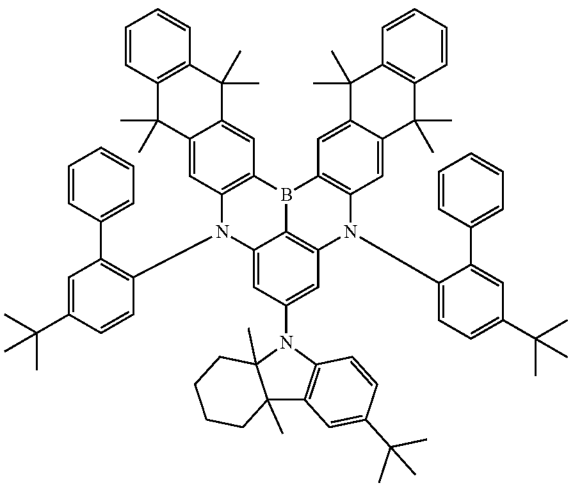
-continued
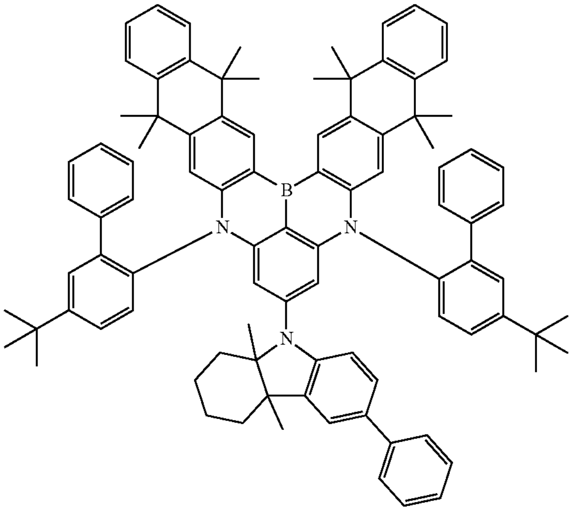
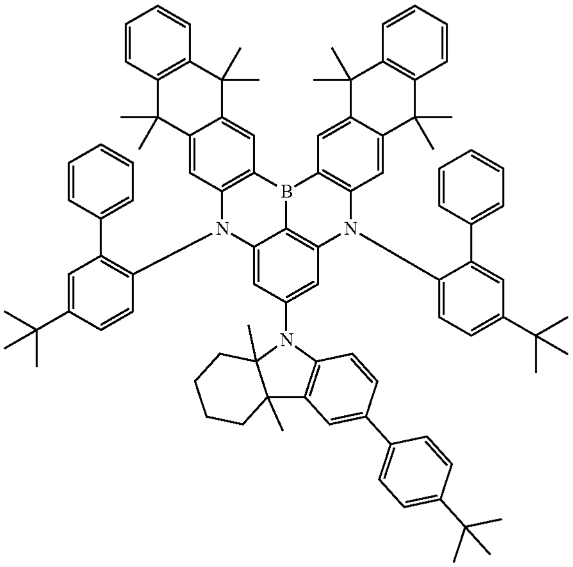
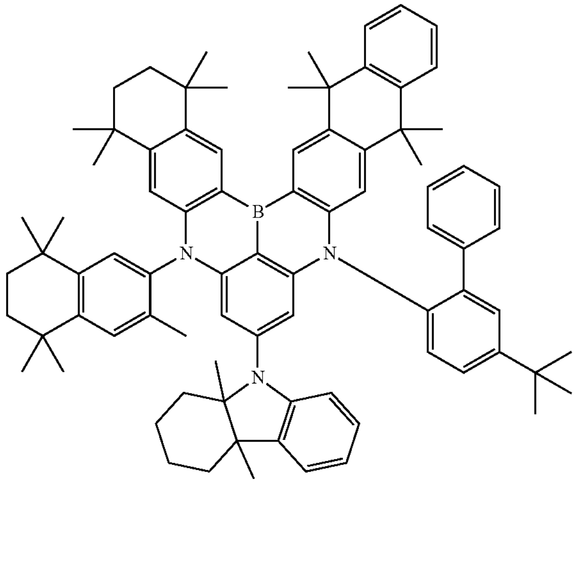

-continued
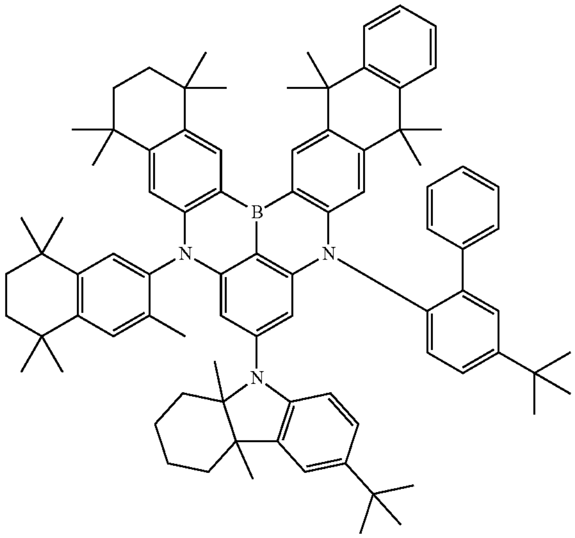
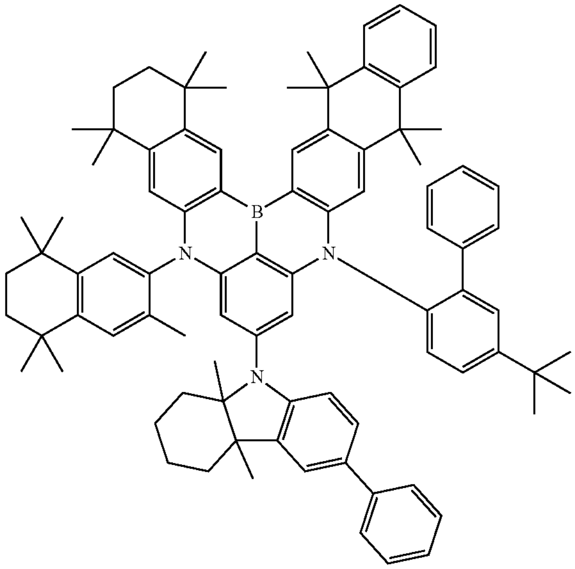
-continued
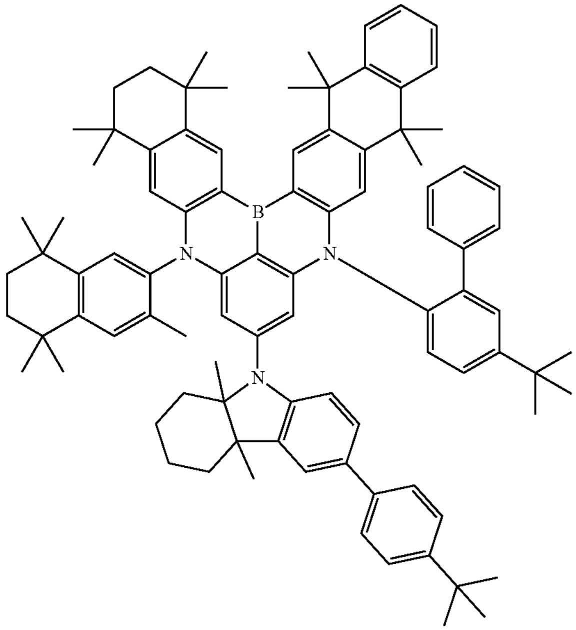
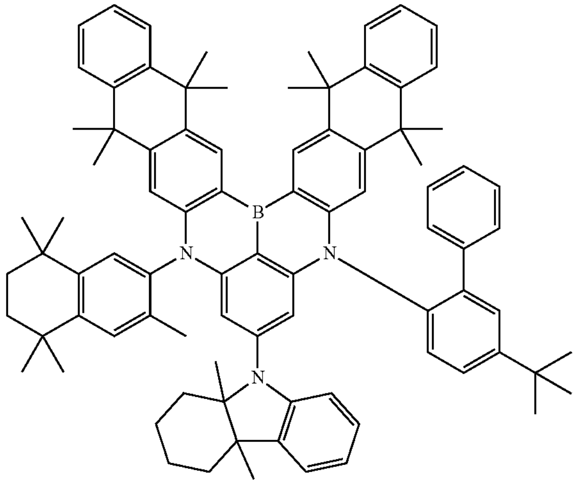
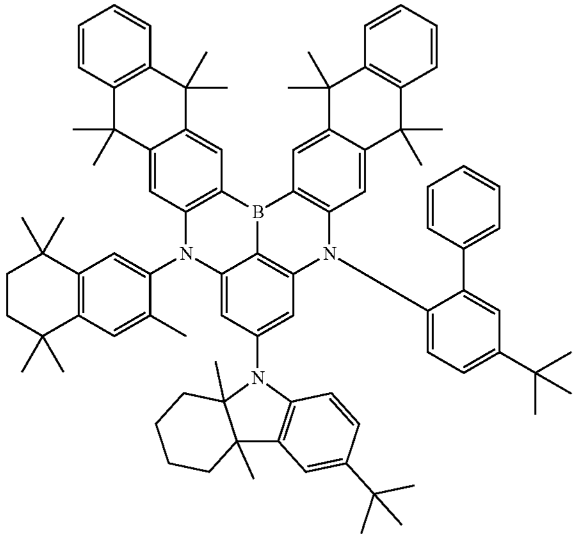

-continued
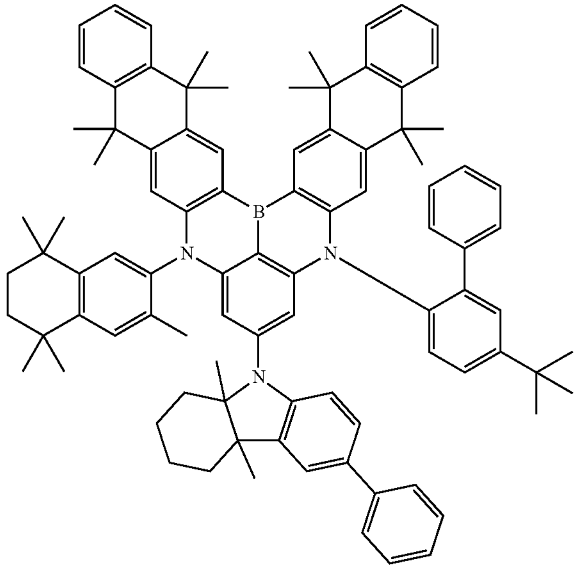
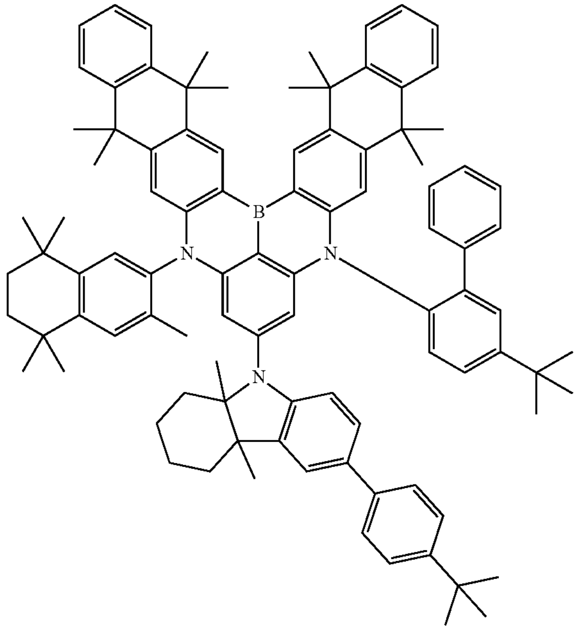
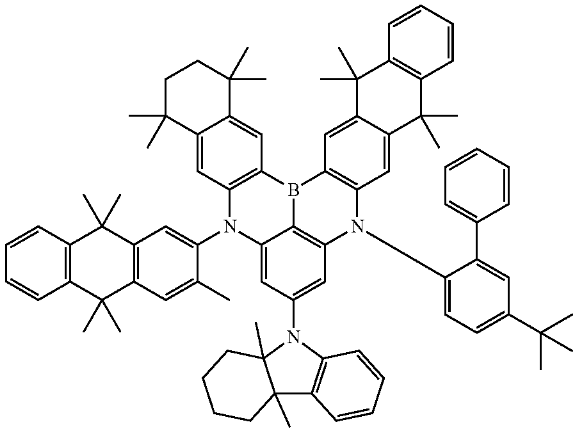
-continued
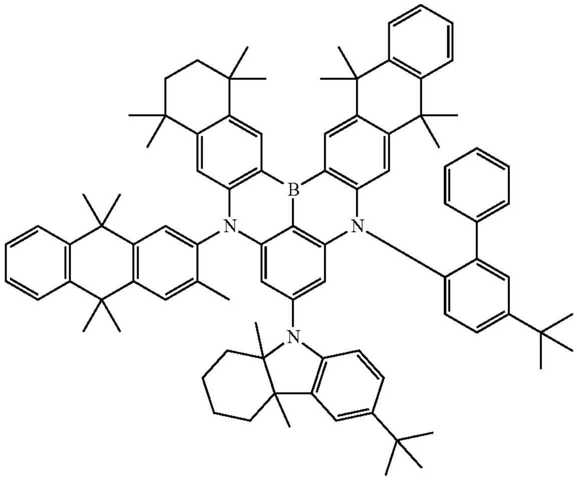
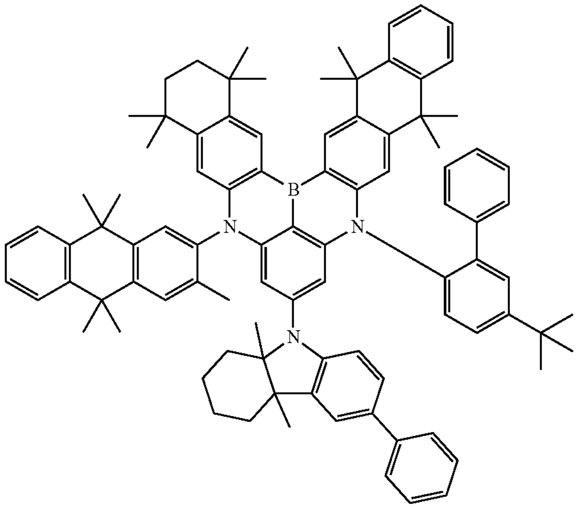
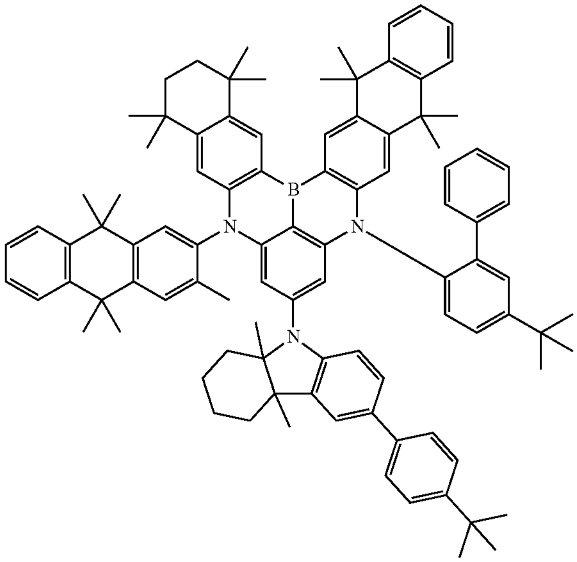

-continued
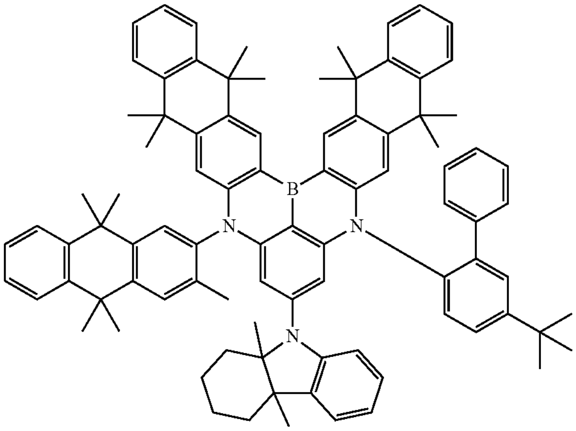
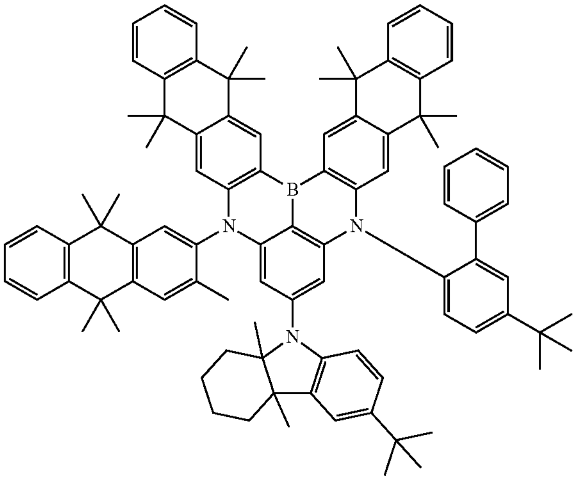
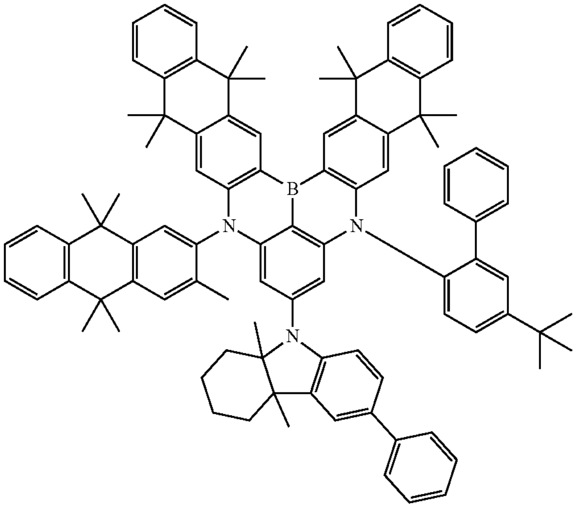
-continued
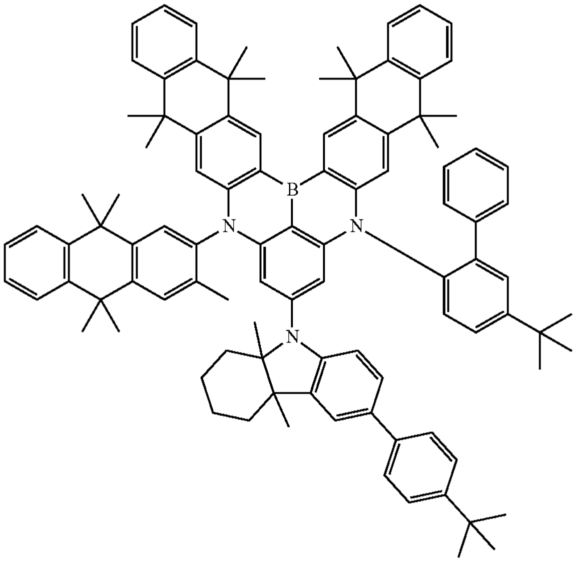
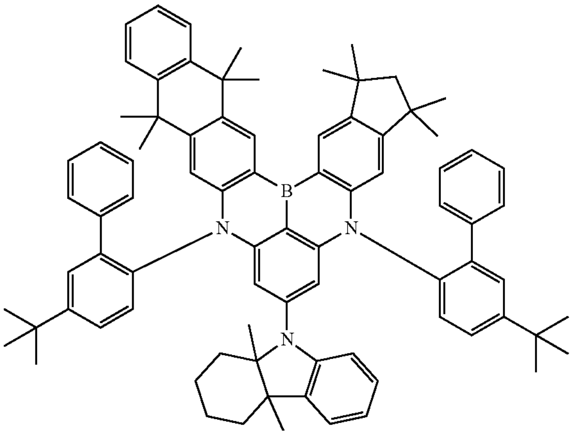
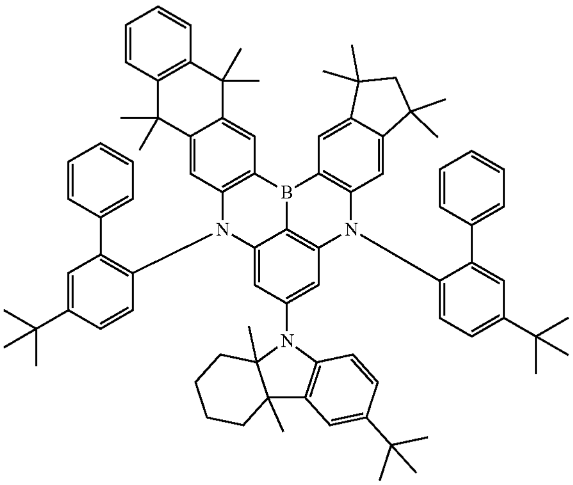

-continued
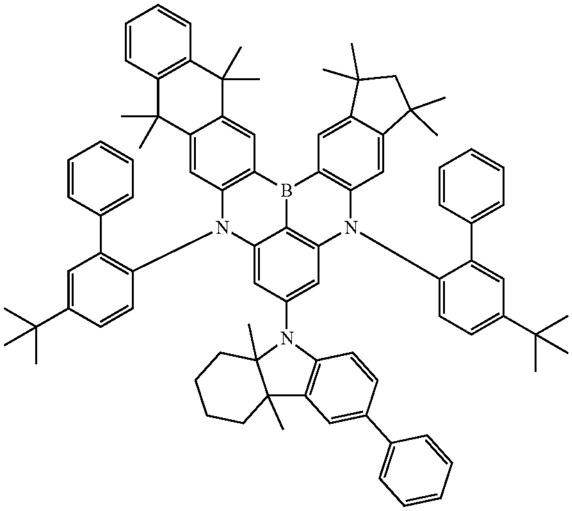
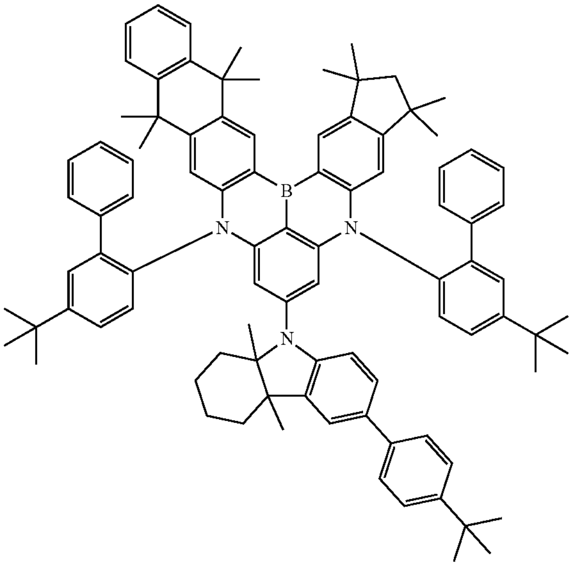
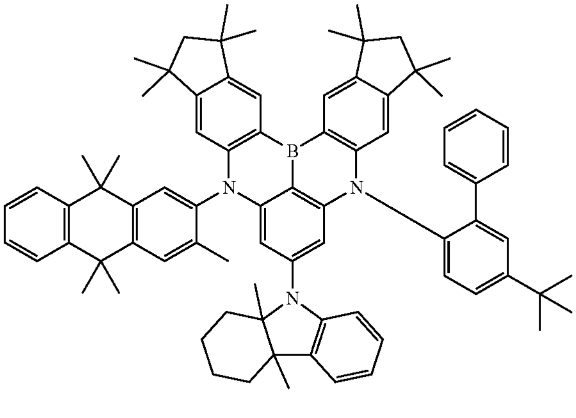
-continued
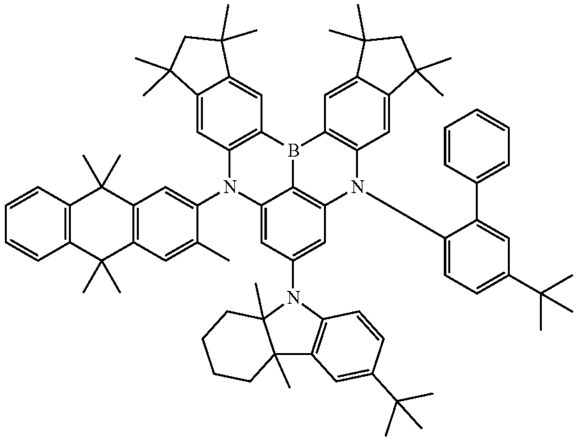
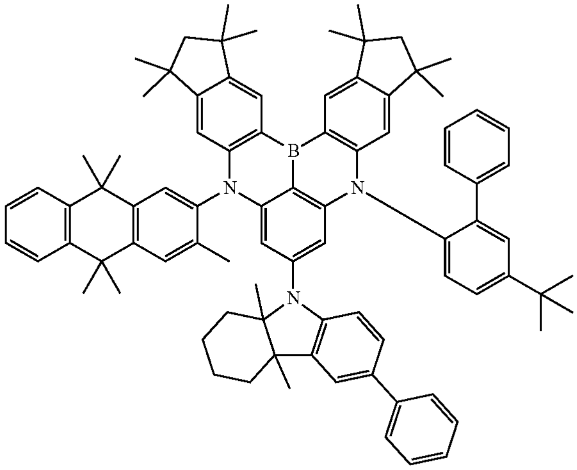
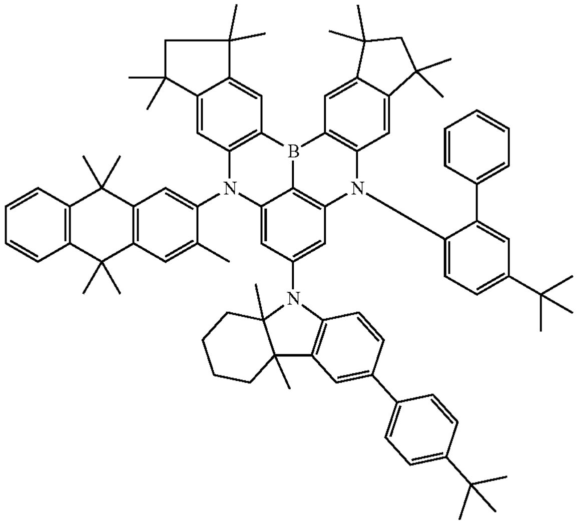

-continued
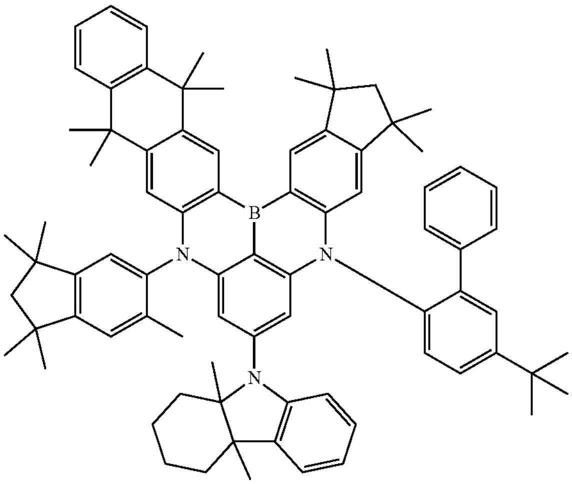
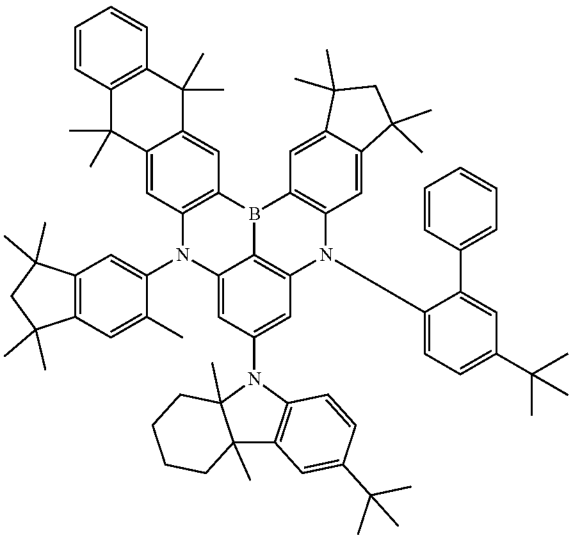
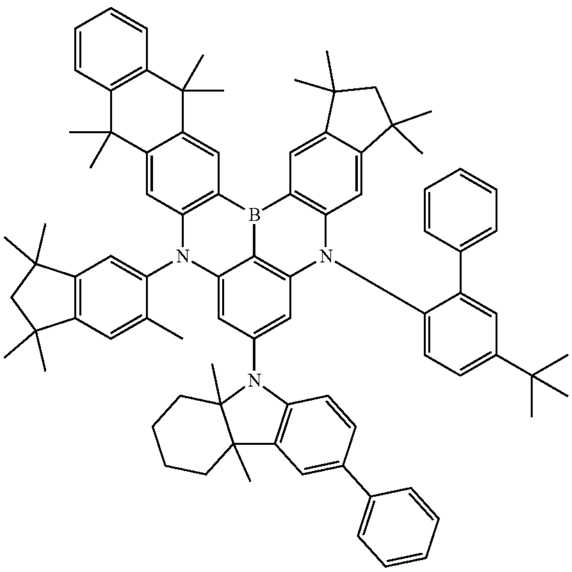
-continued
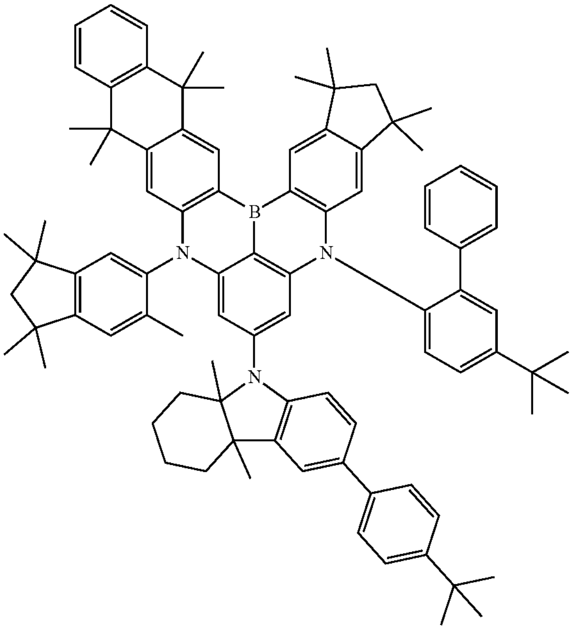
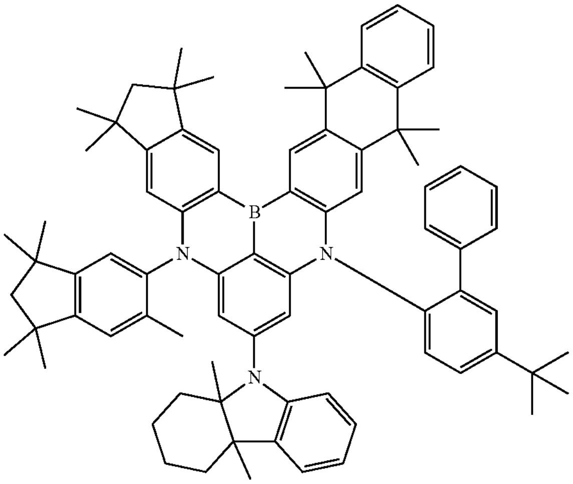
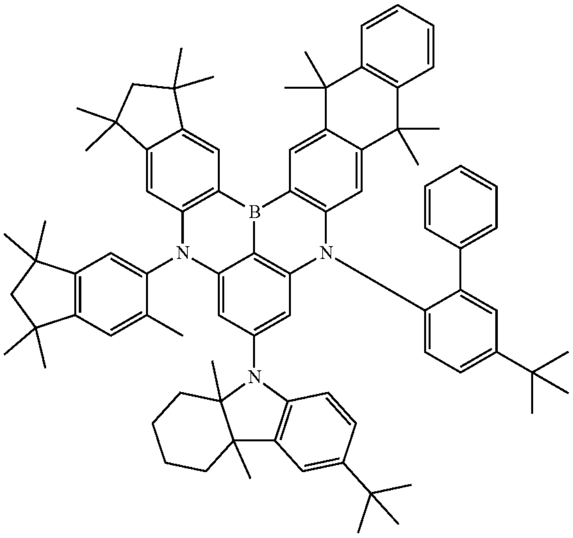

-continued
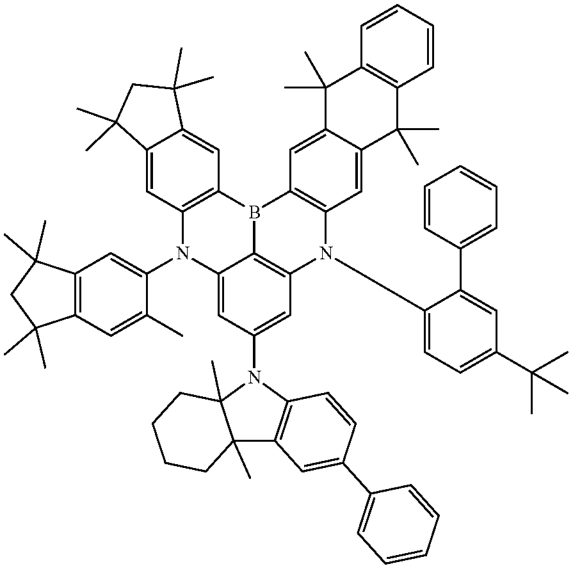
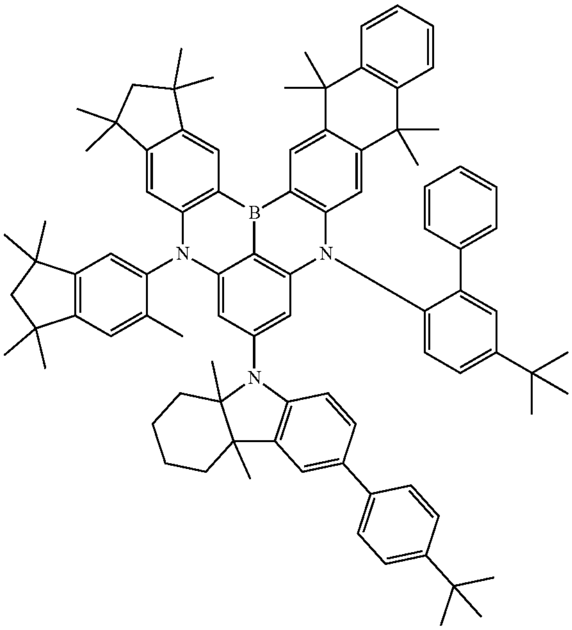
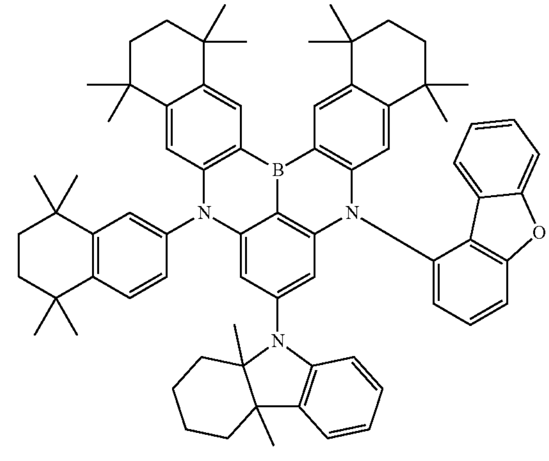
-continued
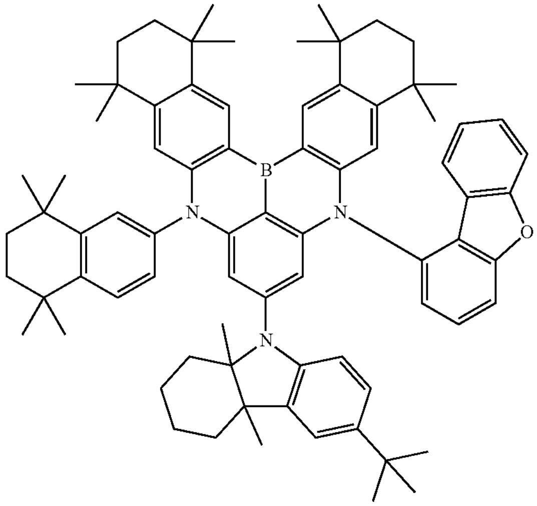
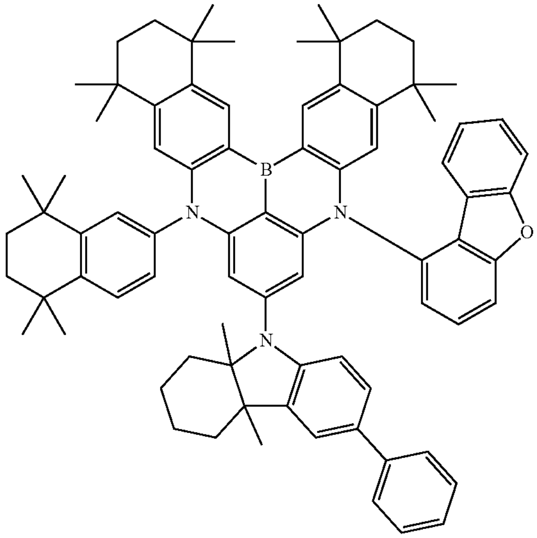
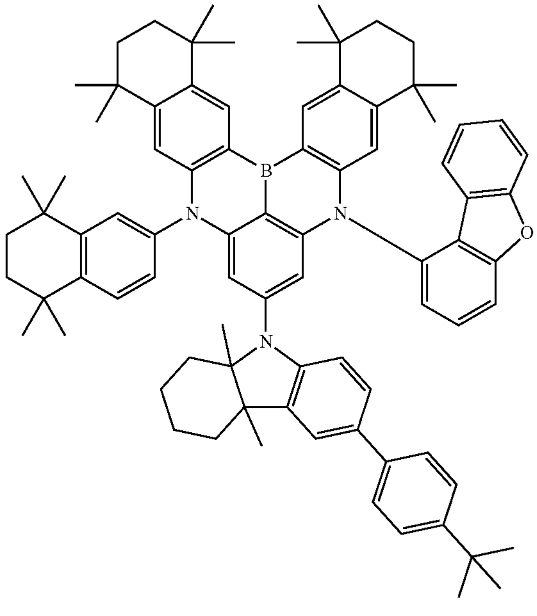

5101
-continued
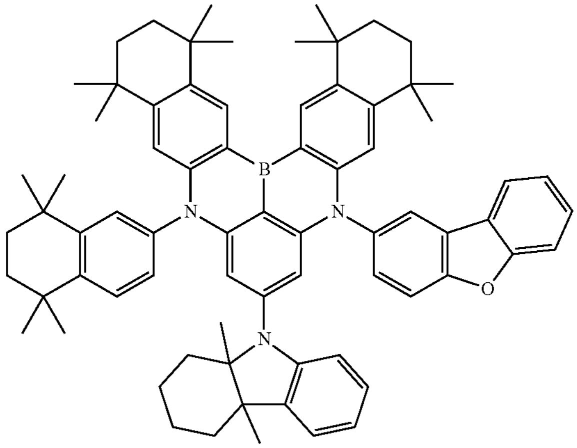
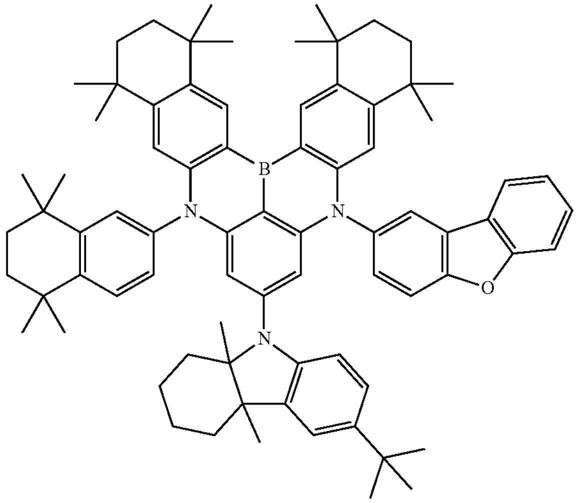
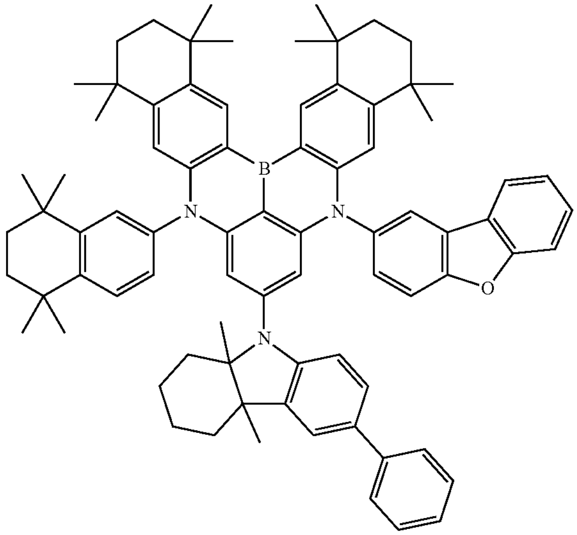
5102
-continued
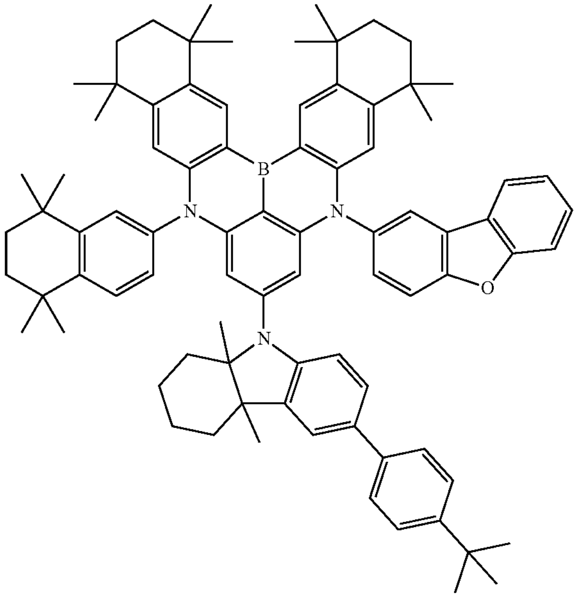
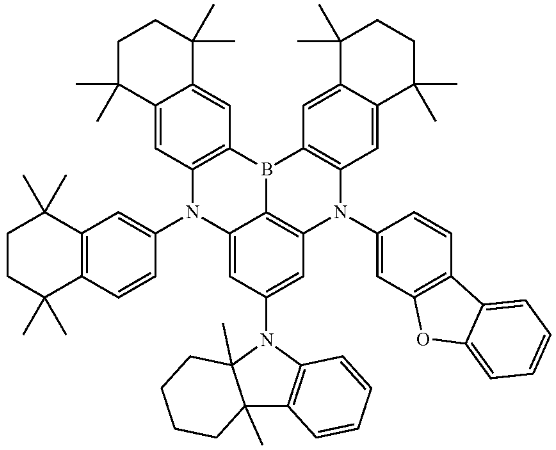
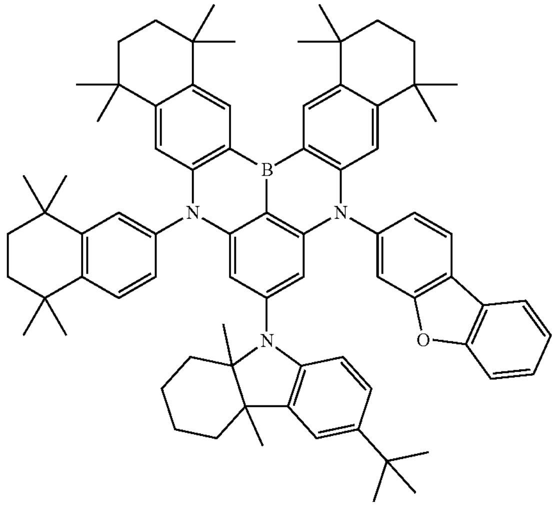

-continued
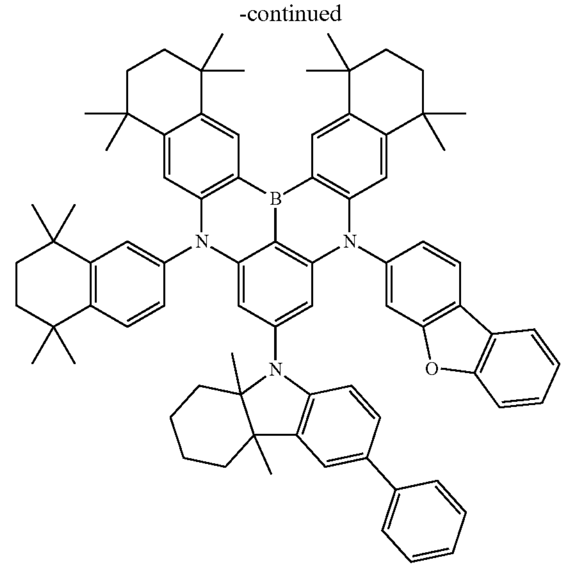
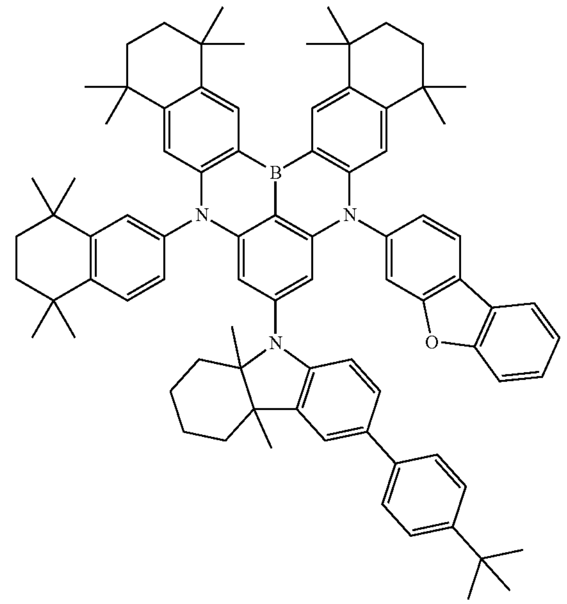
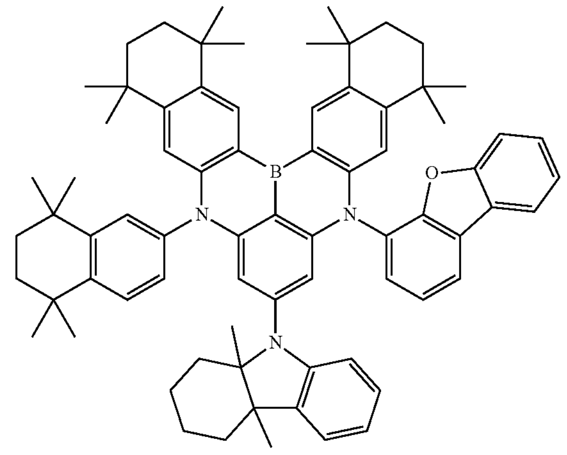
-continued
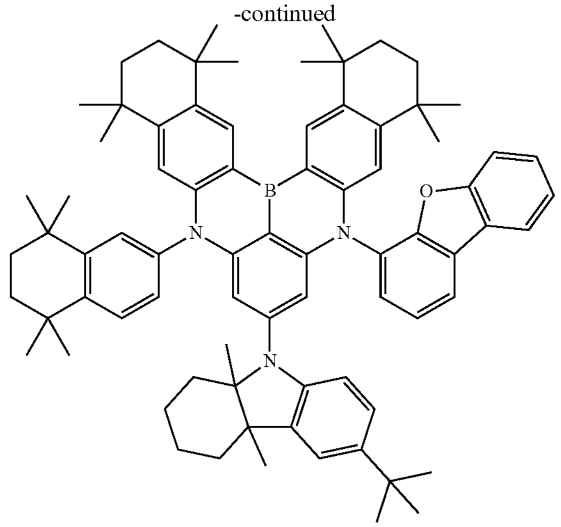
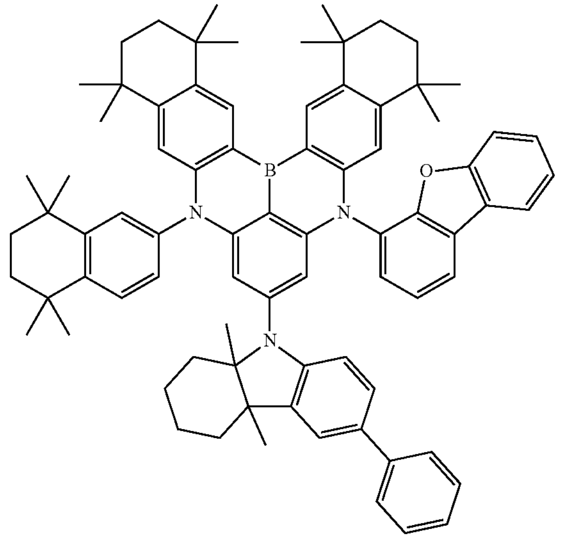
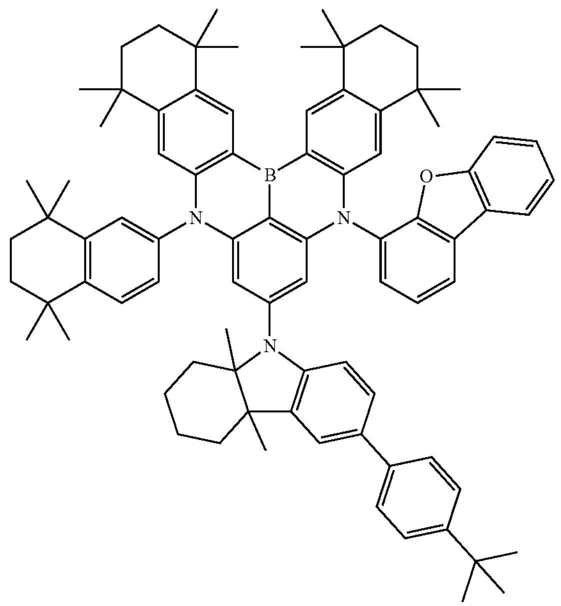

-continued
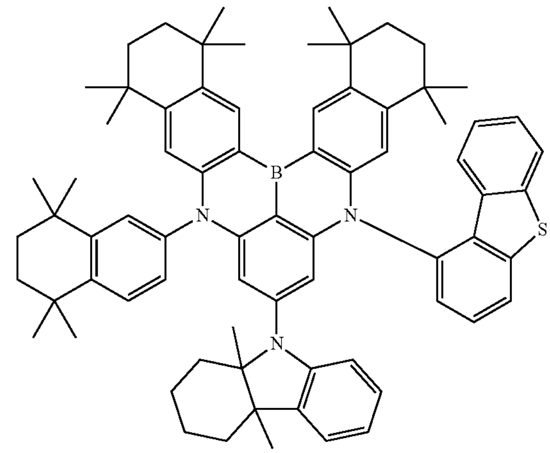
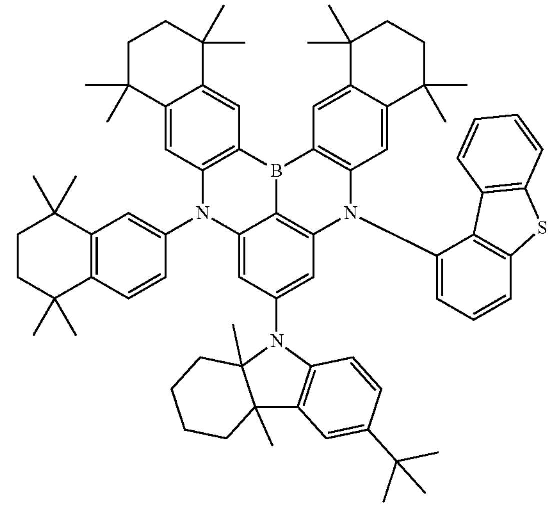
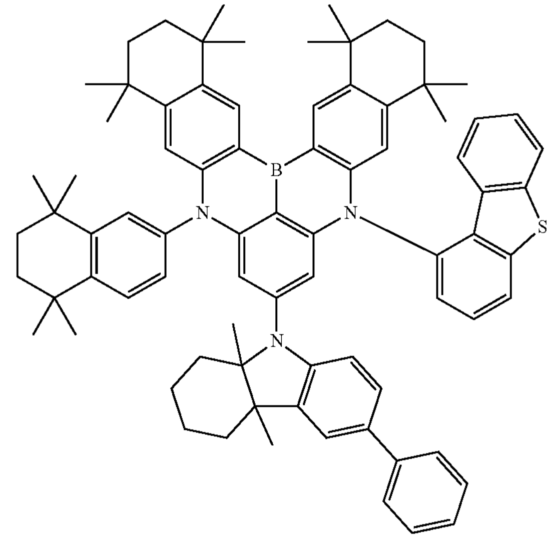
-continued
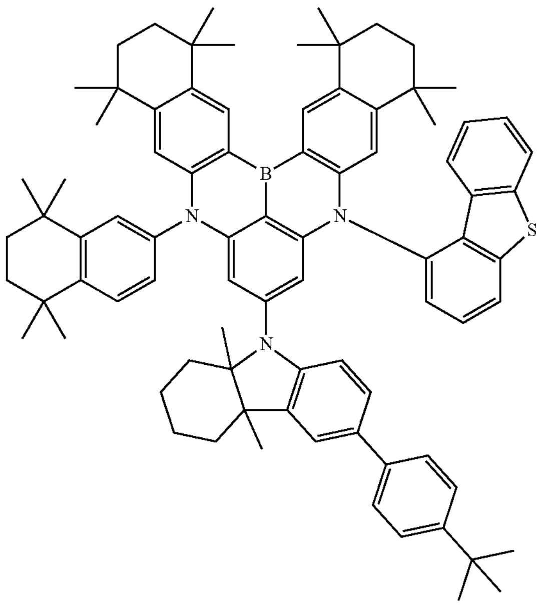
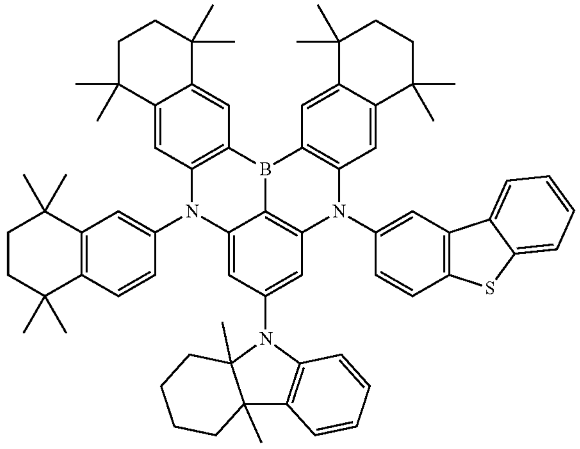
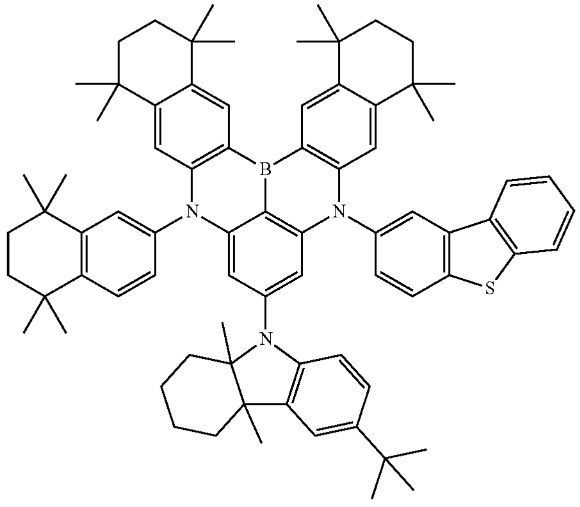

-continued
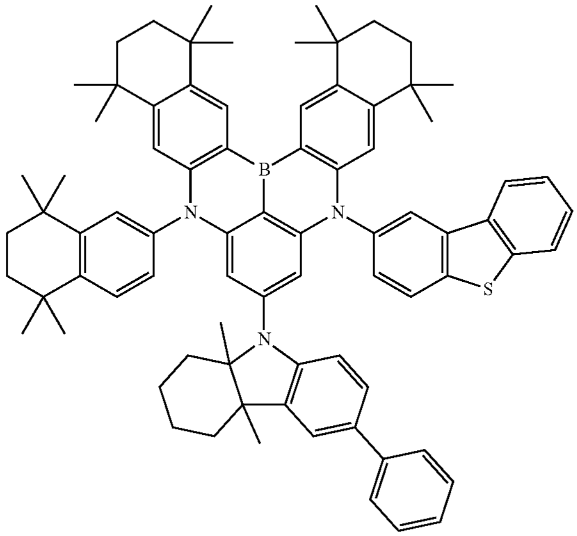
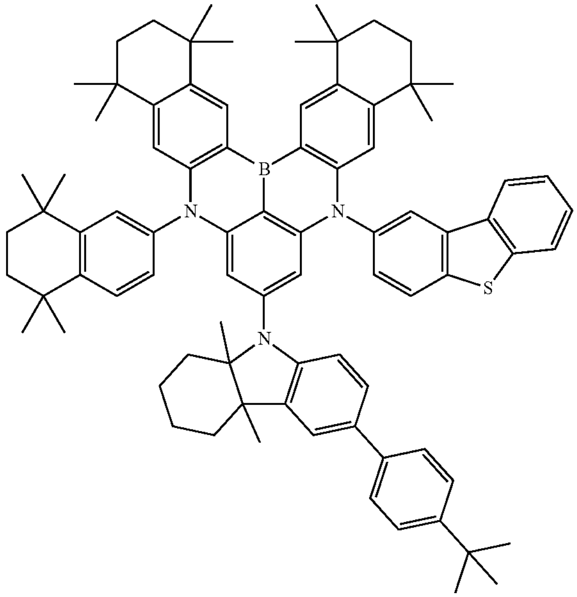
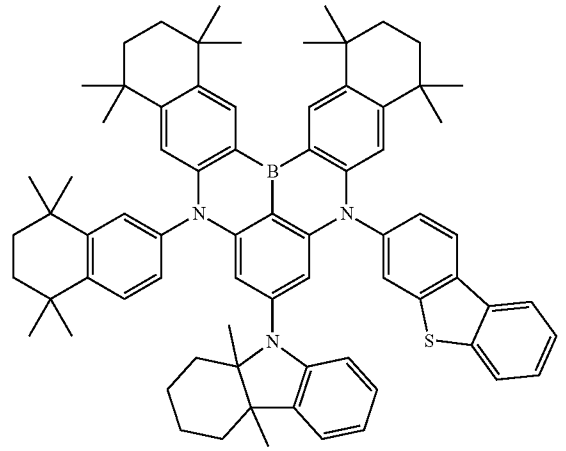
-continued
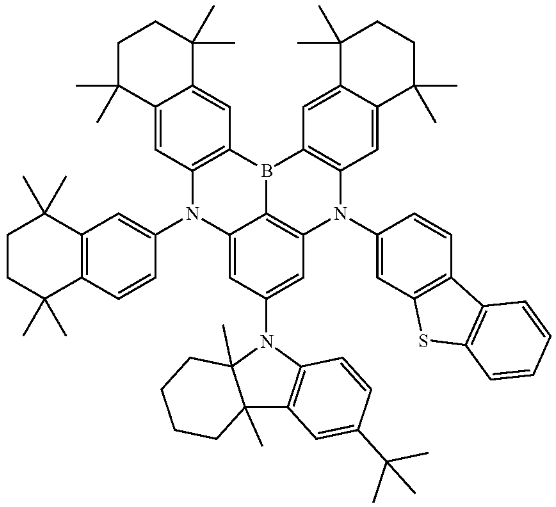
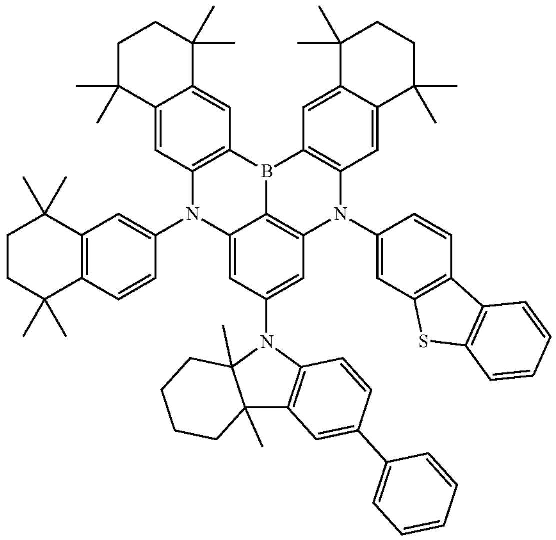
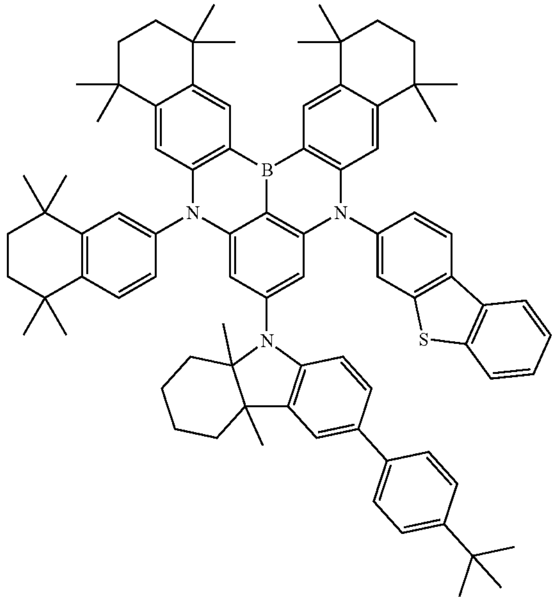

-continued
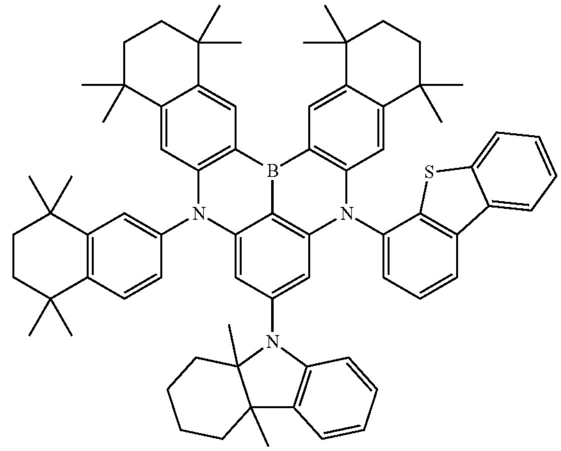
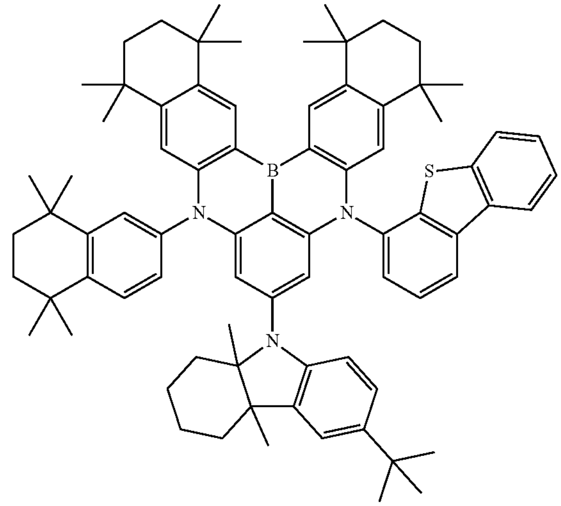
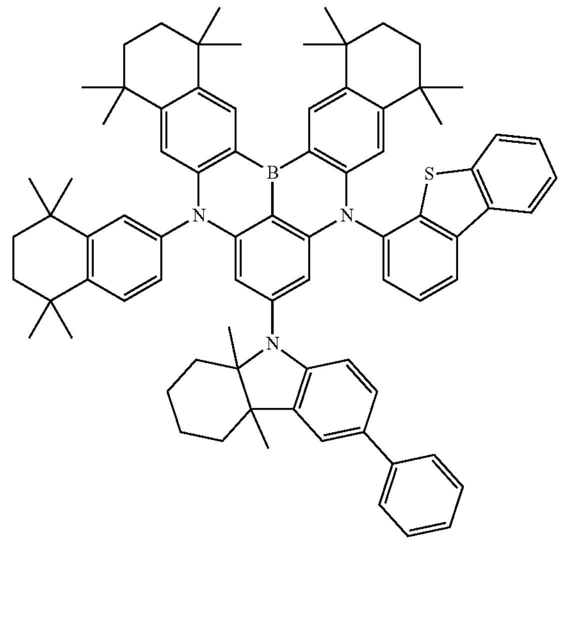
-continued
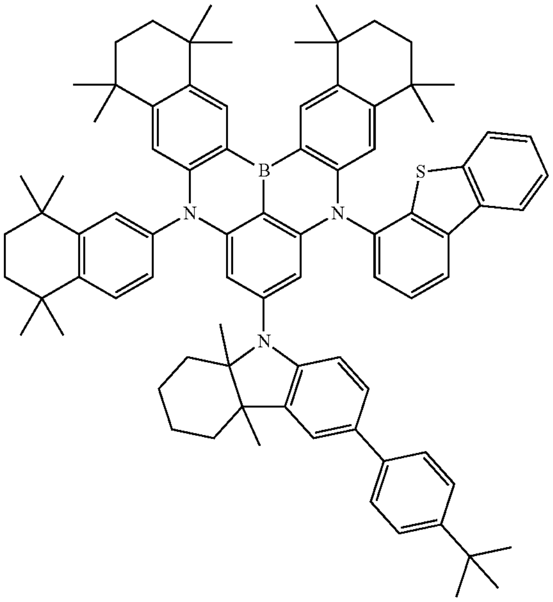
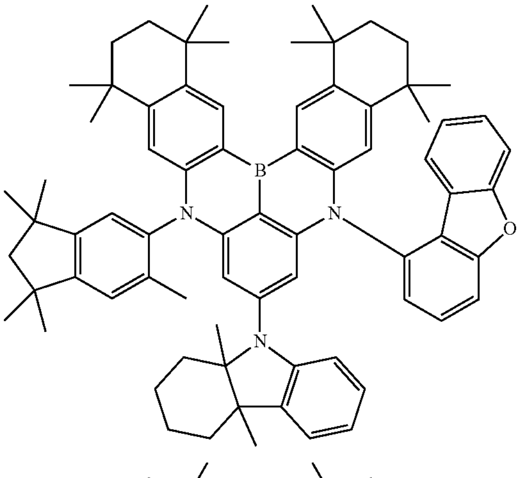
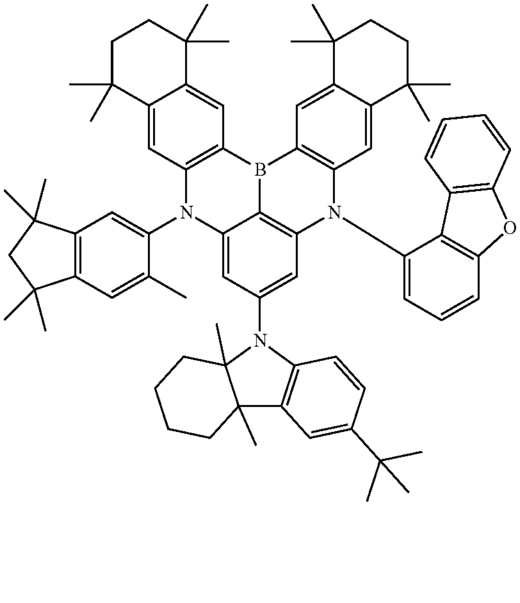

-continued
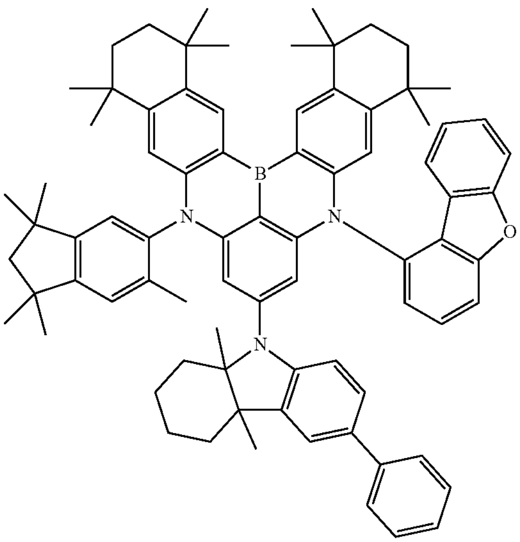
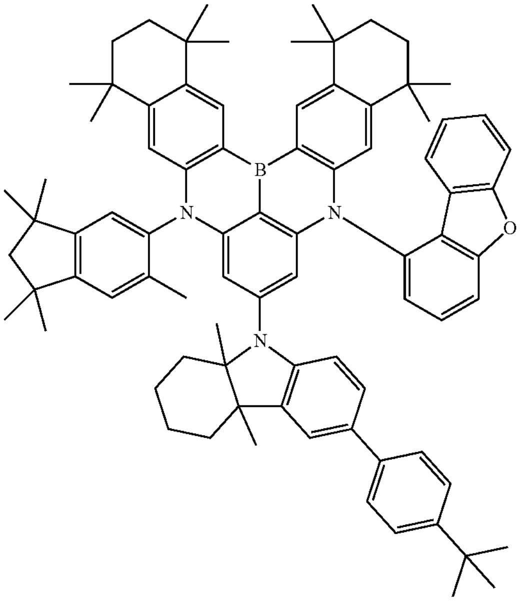
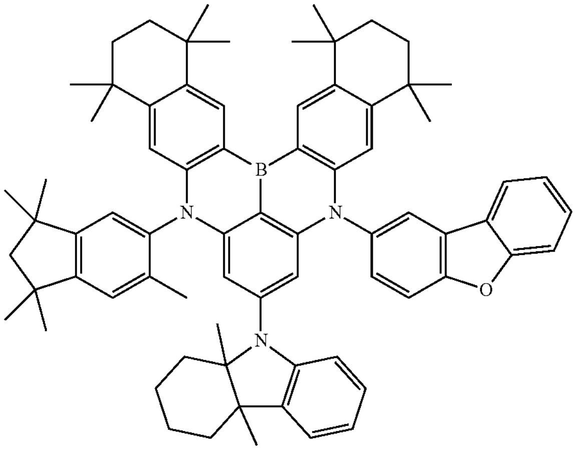
-continued
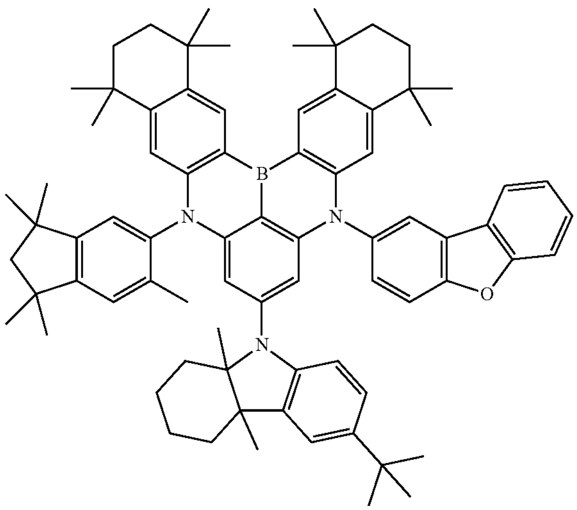
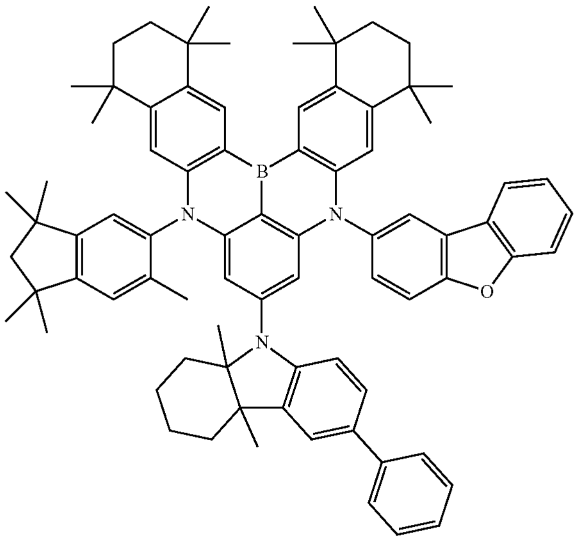
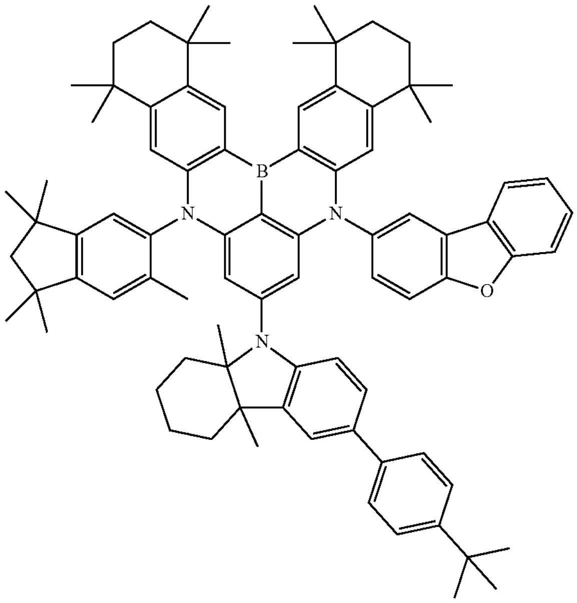

-continued
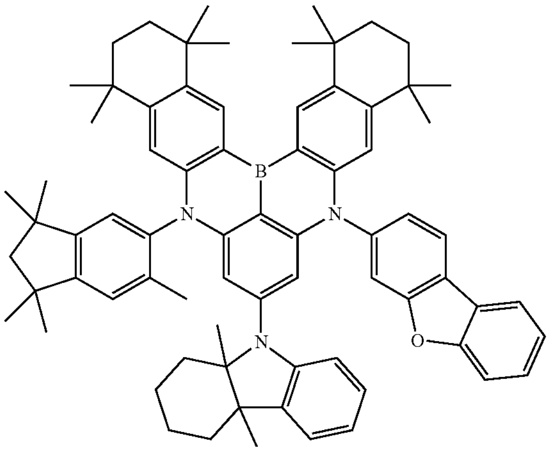
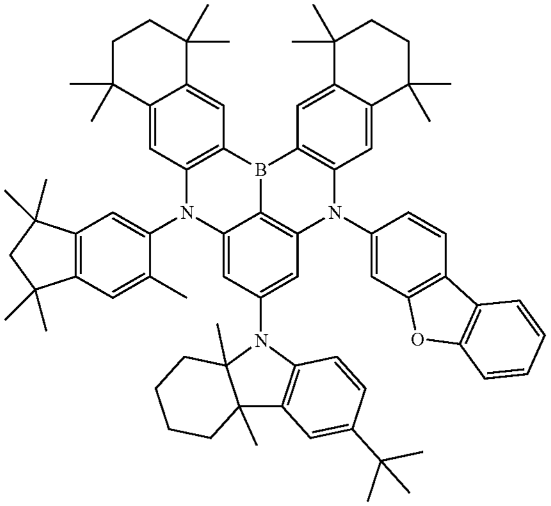
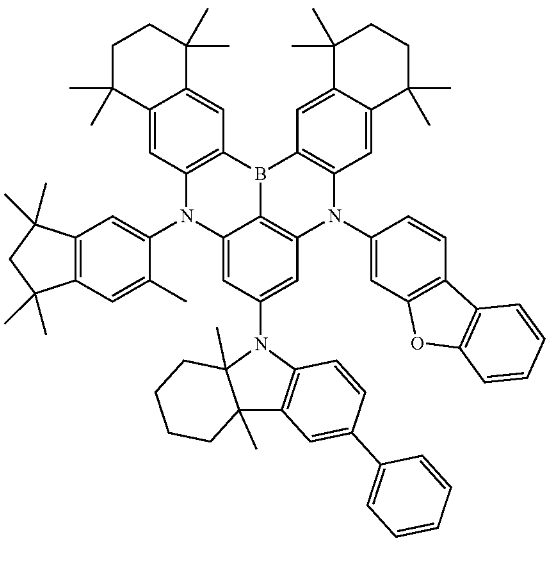
-continued
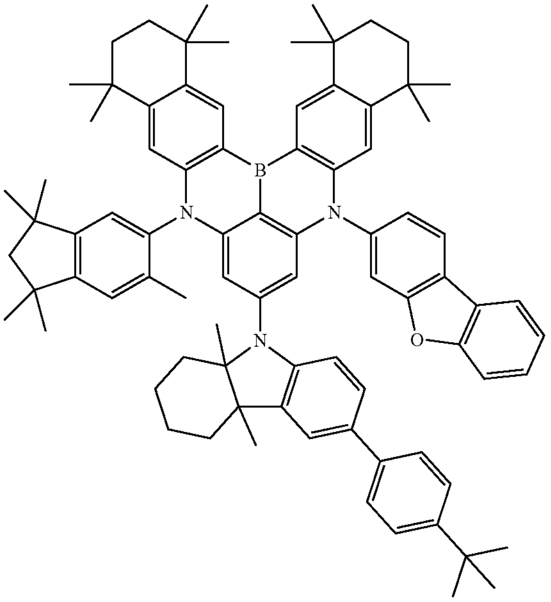
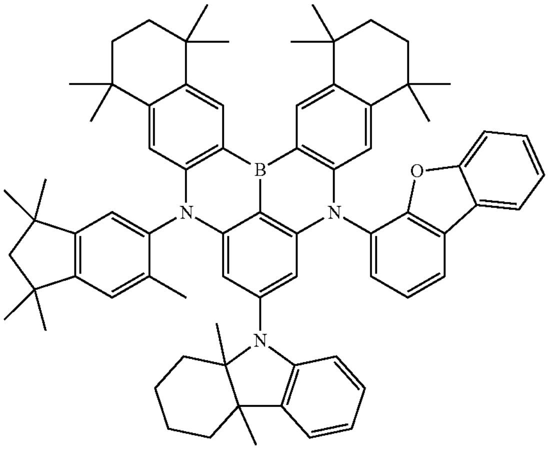
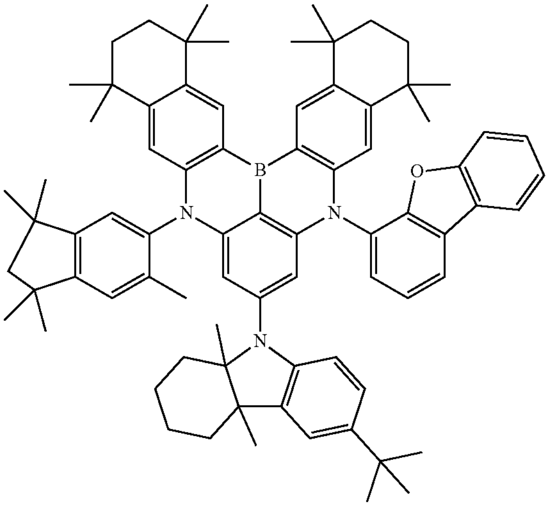

-continued
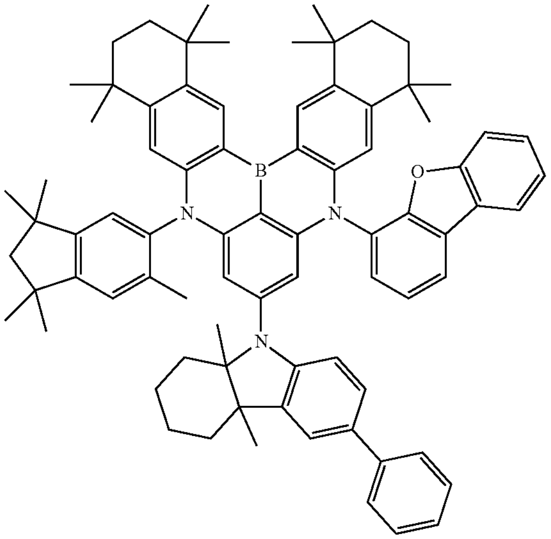
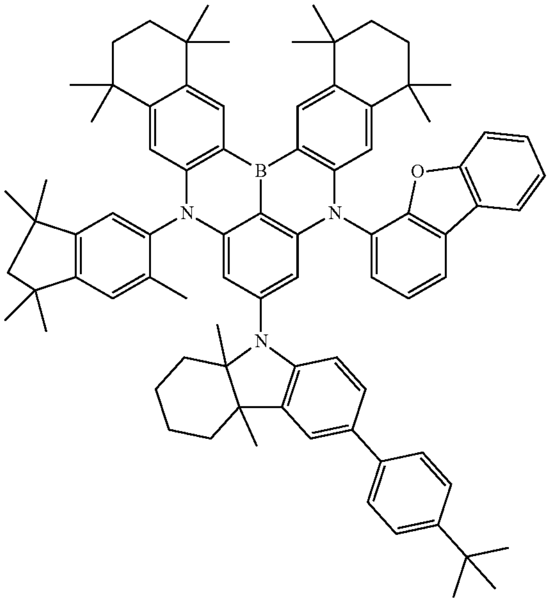
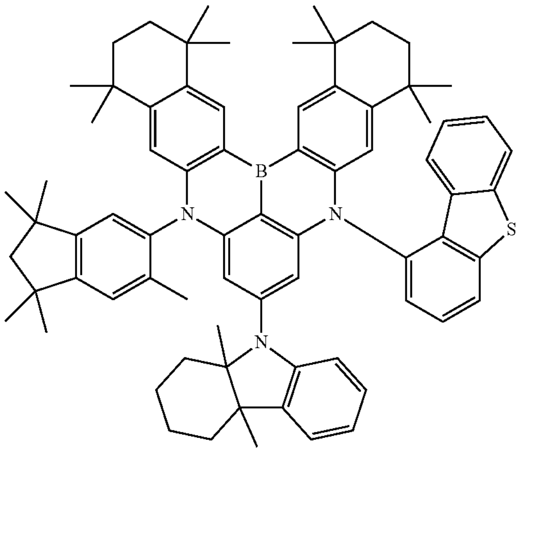
-continued
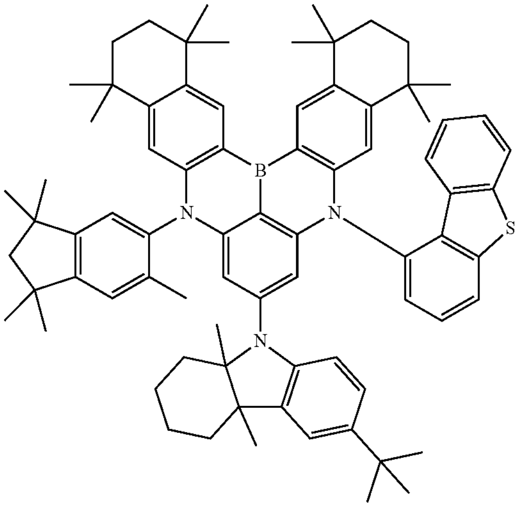
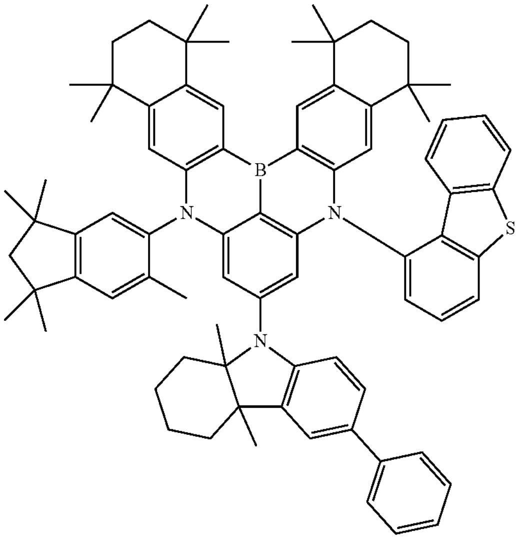
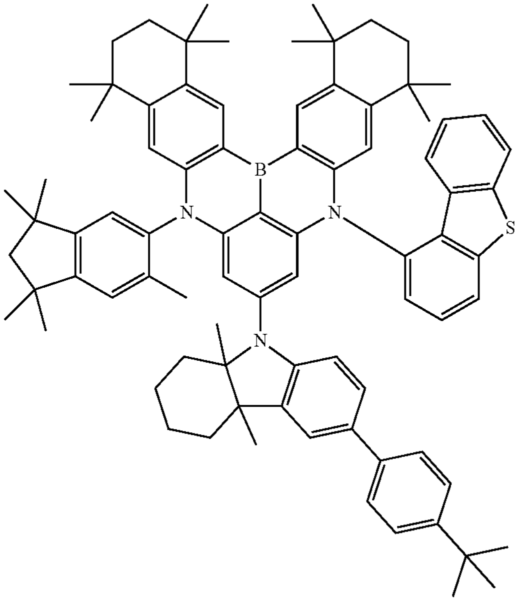

-continued
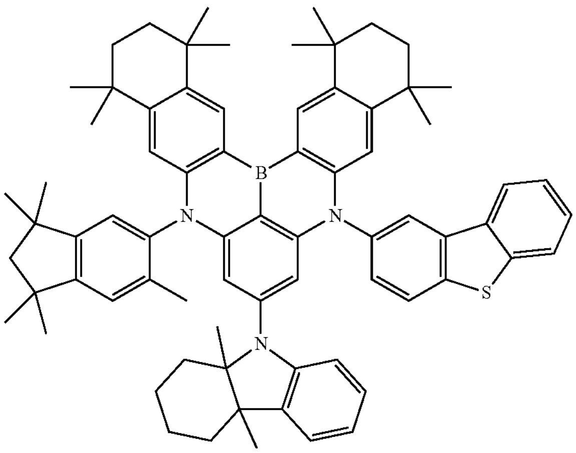
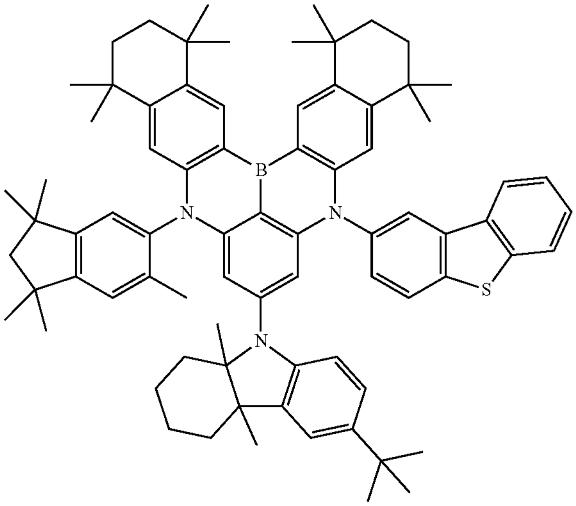
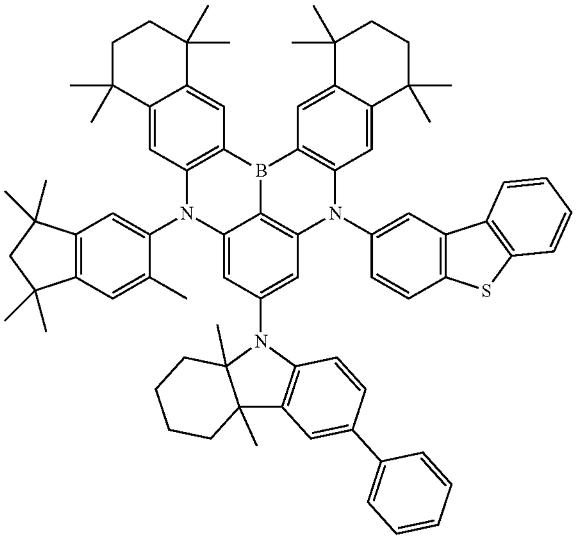
-continued
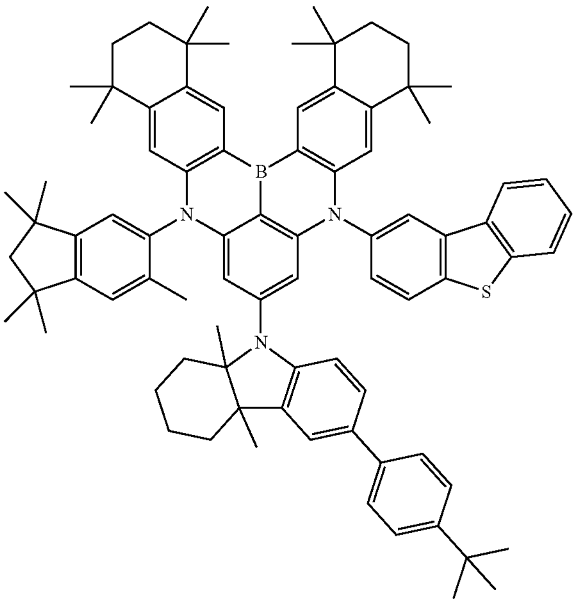
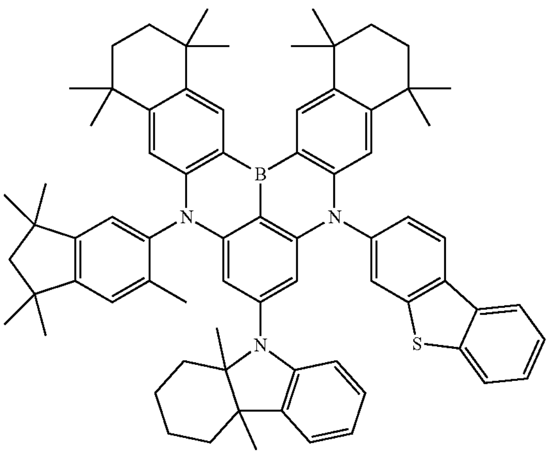
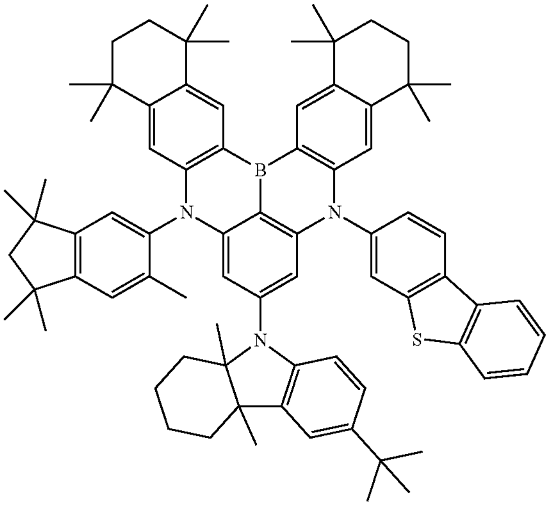

-continued
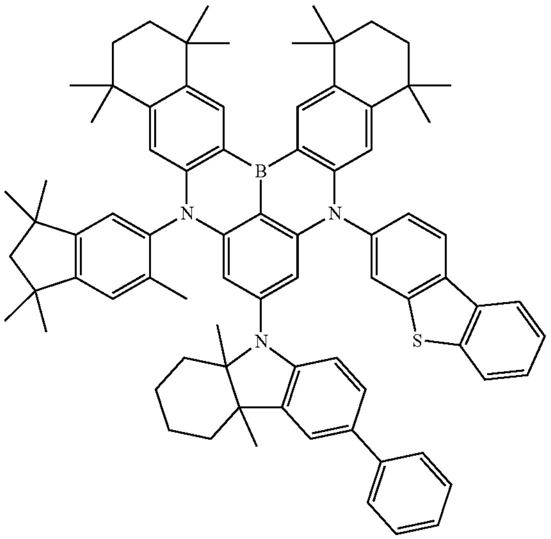
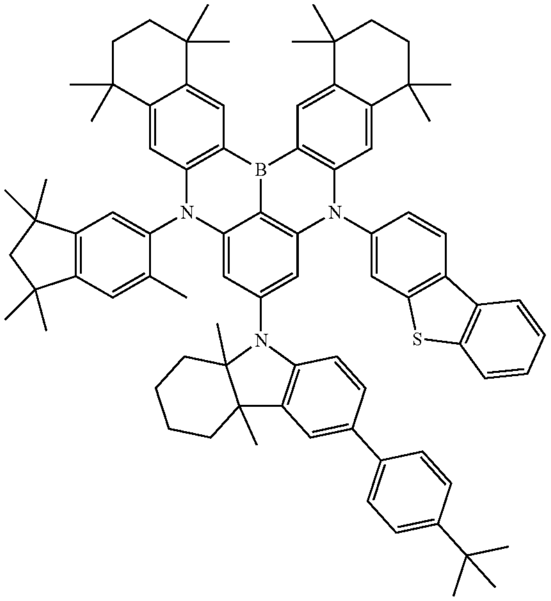
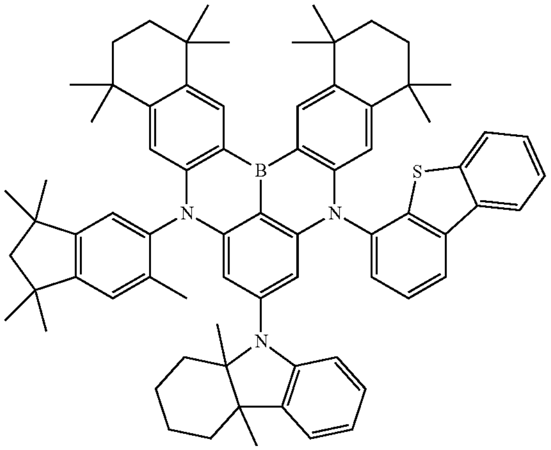
-continued
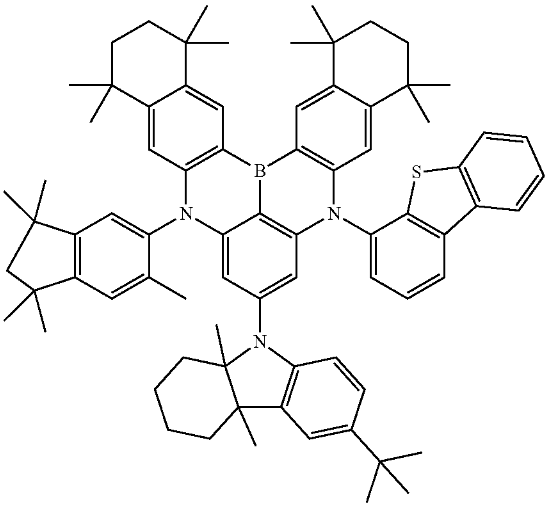
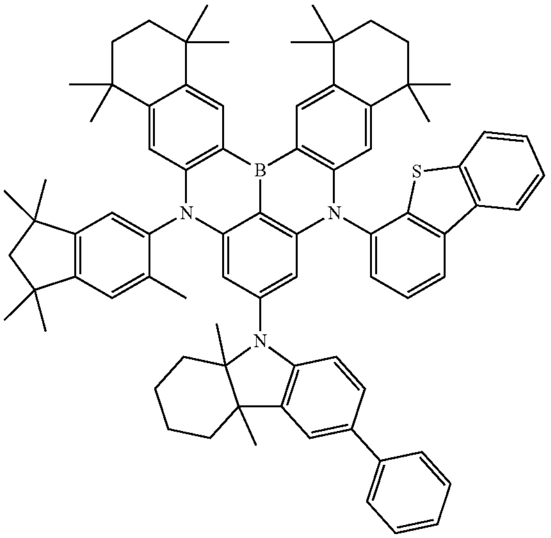
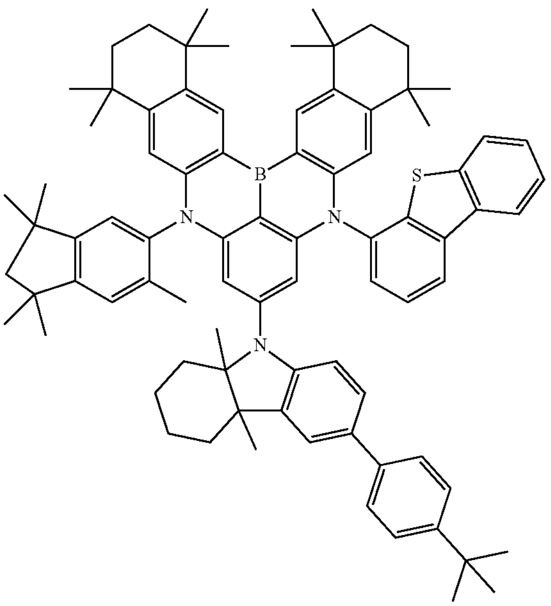

-continued
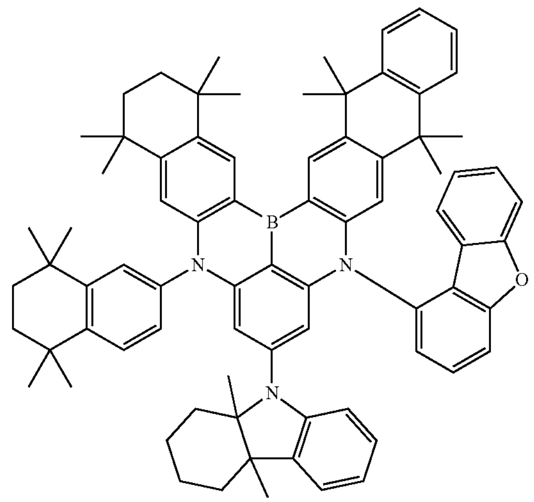
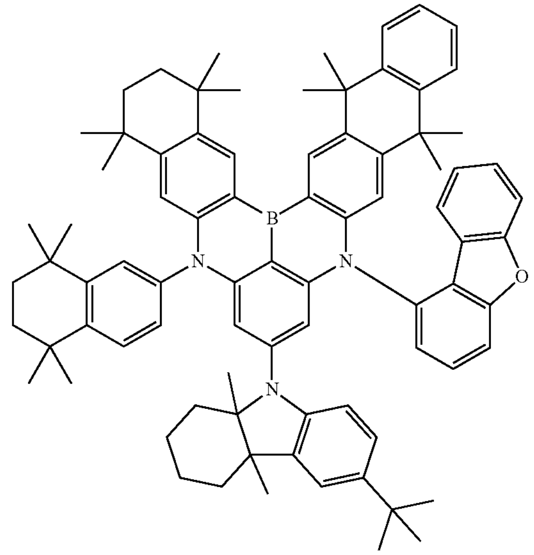
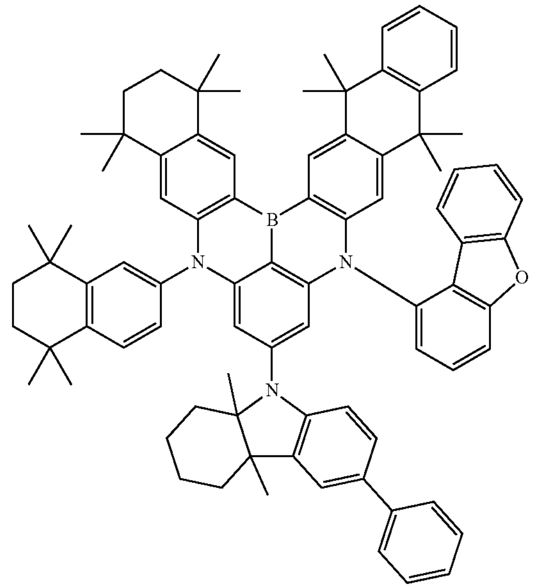
-continued
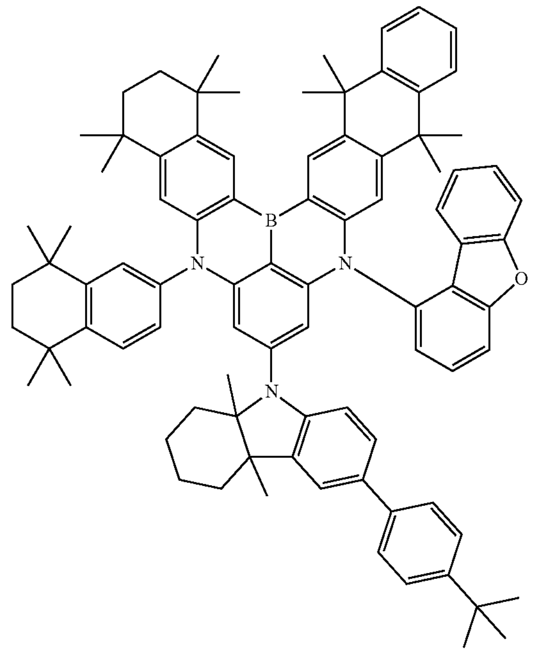
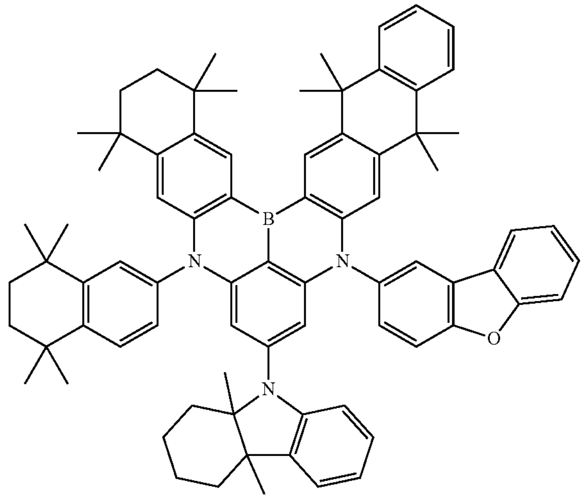
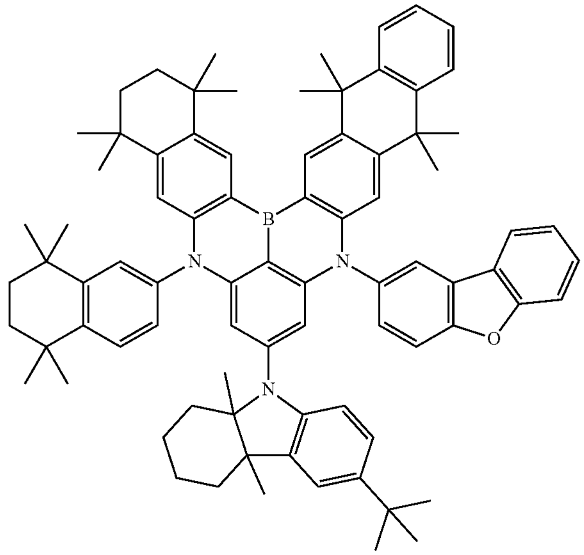

-continued
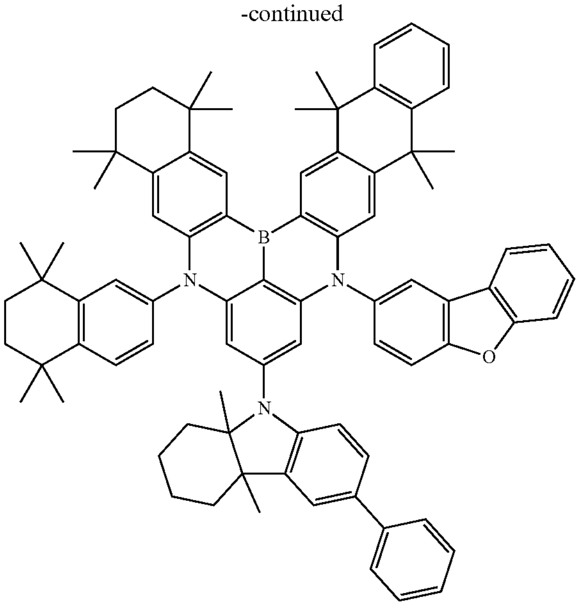
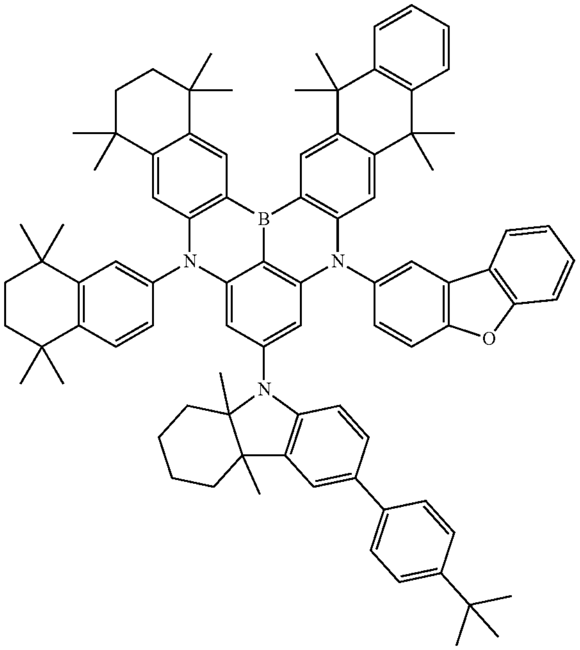
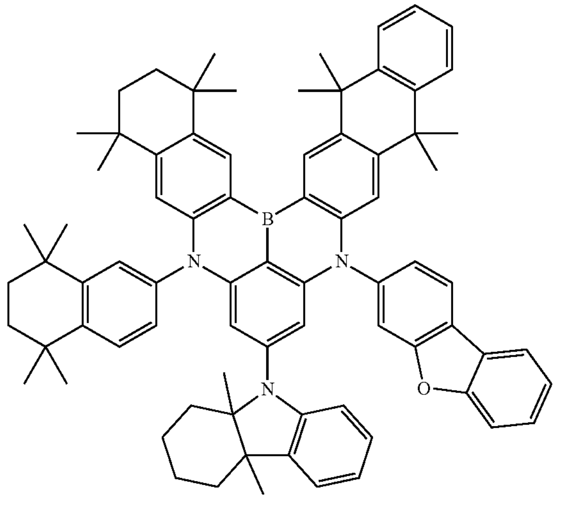
-continued
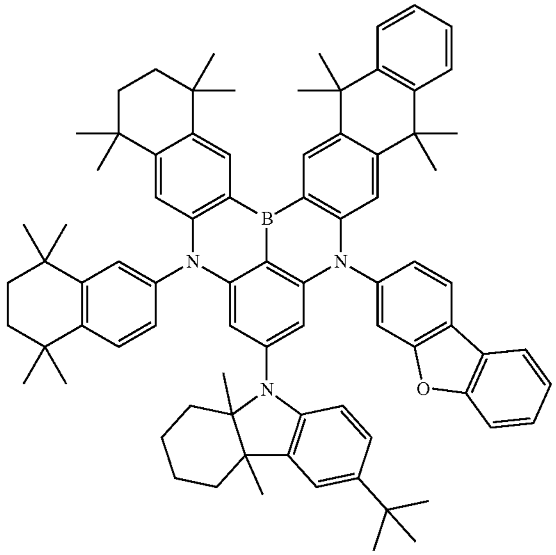
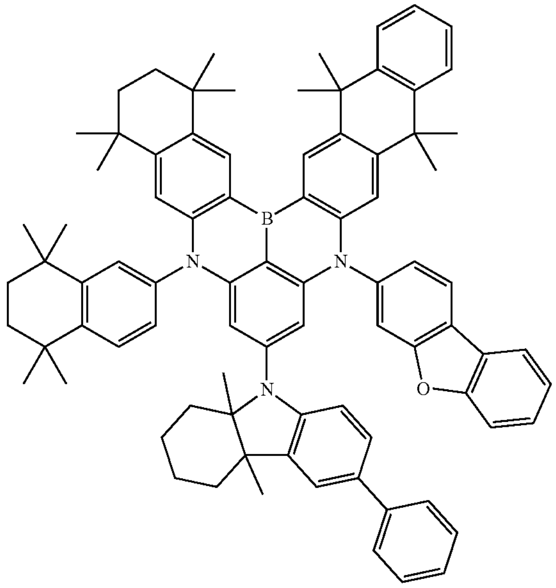

-continued
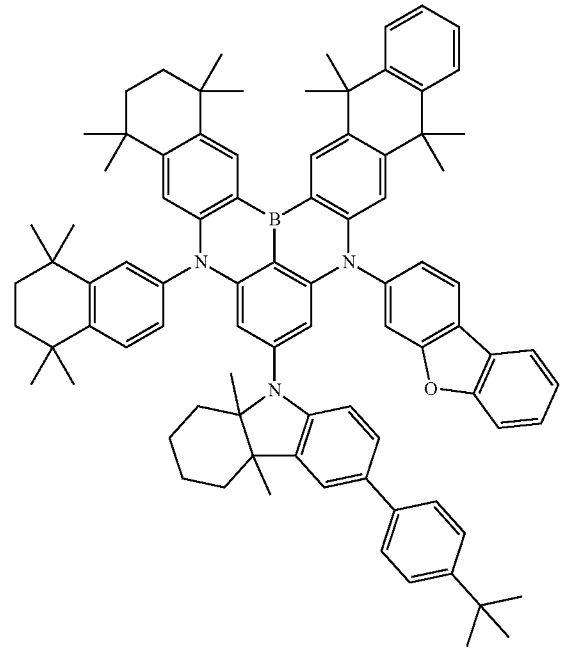
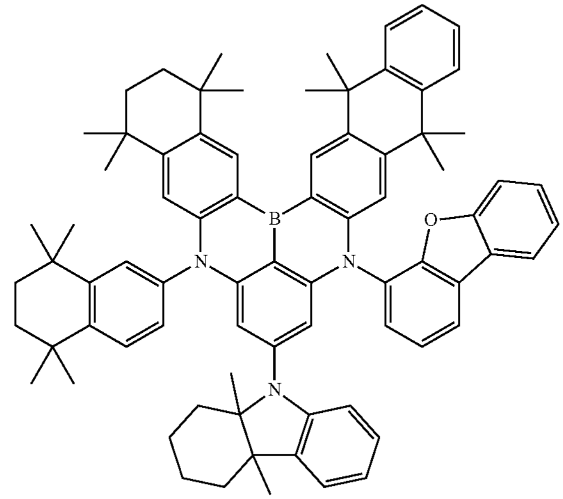
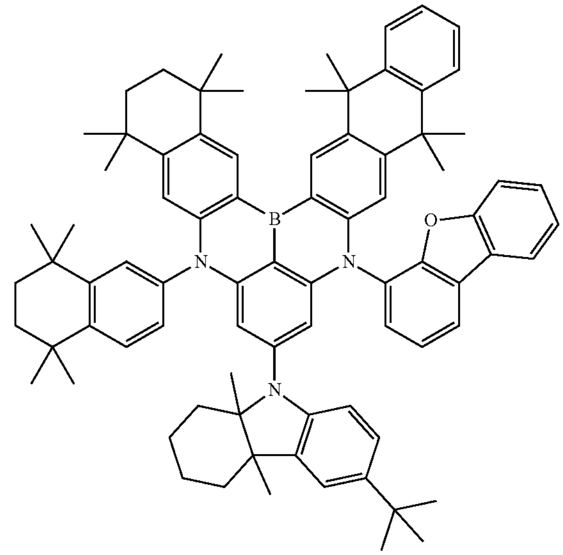
-continued
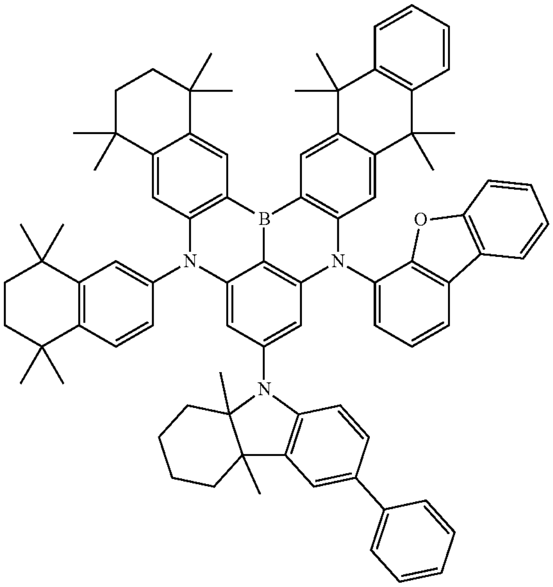
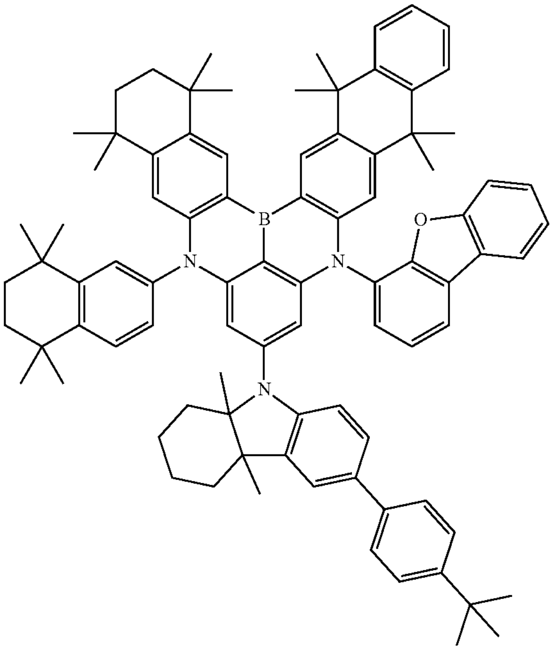

-continued
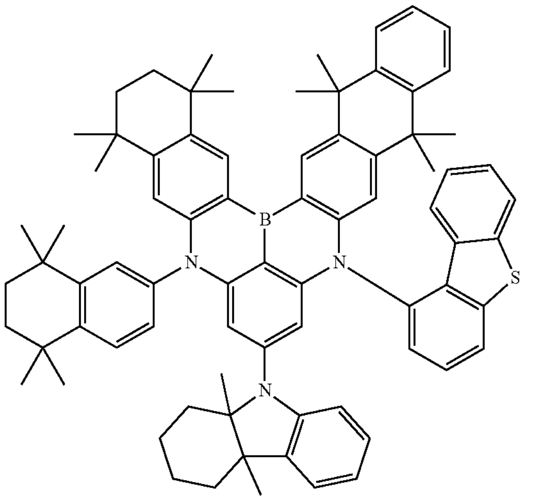
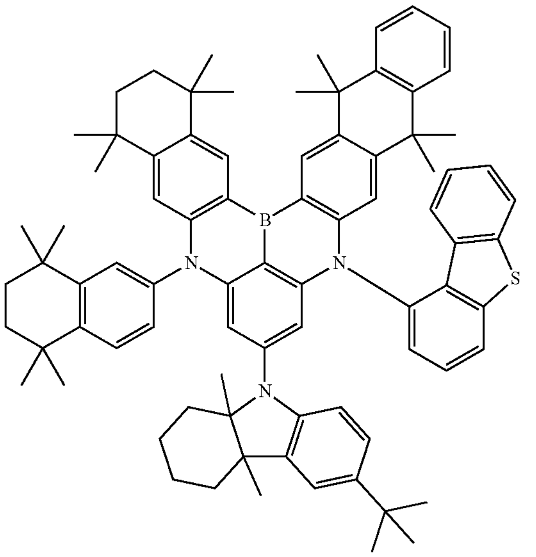
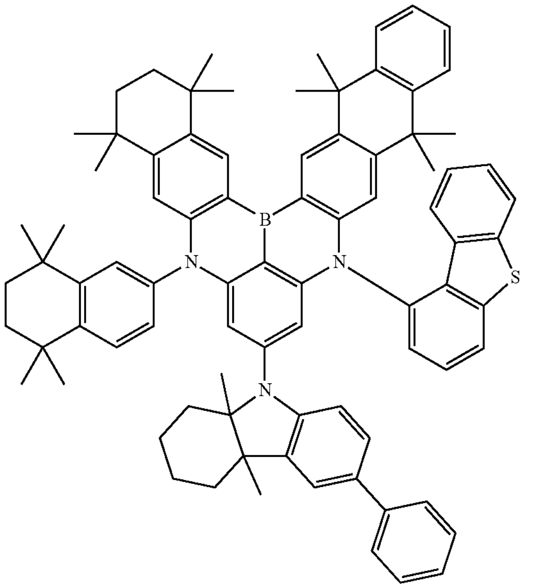
-continued
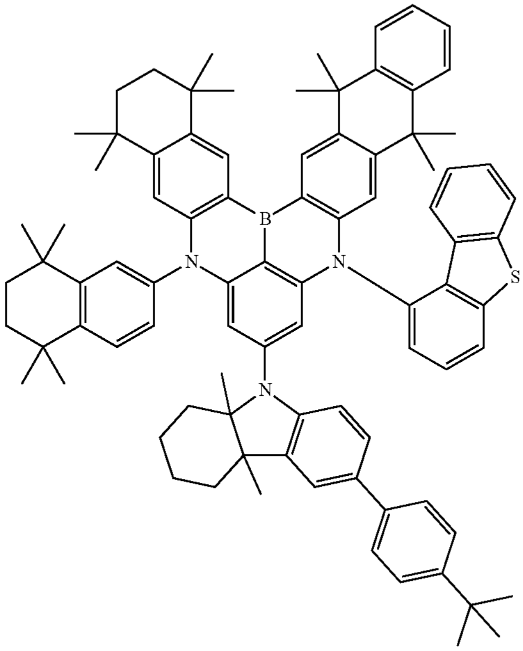
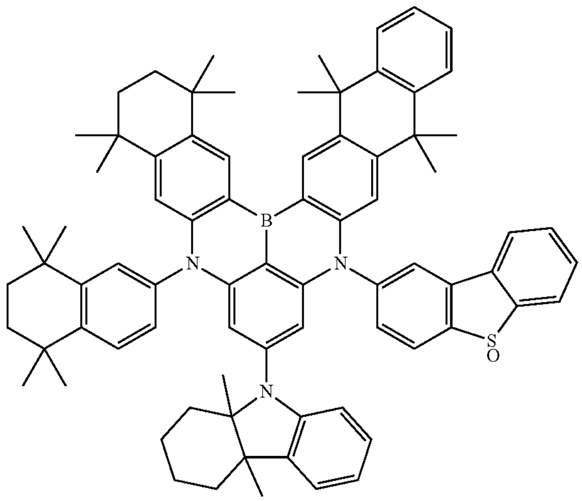
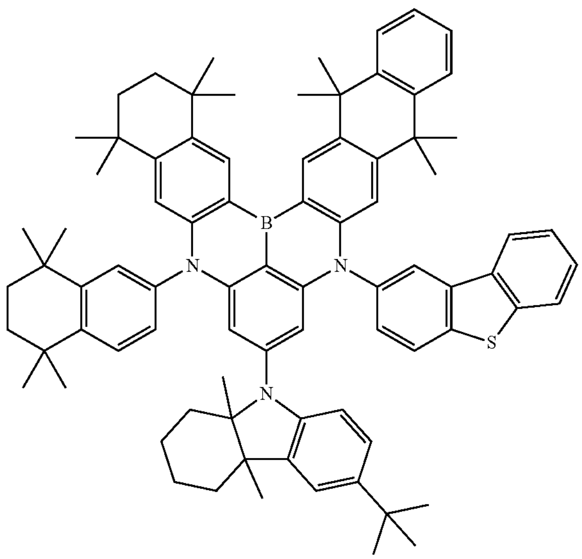

-continued
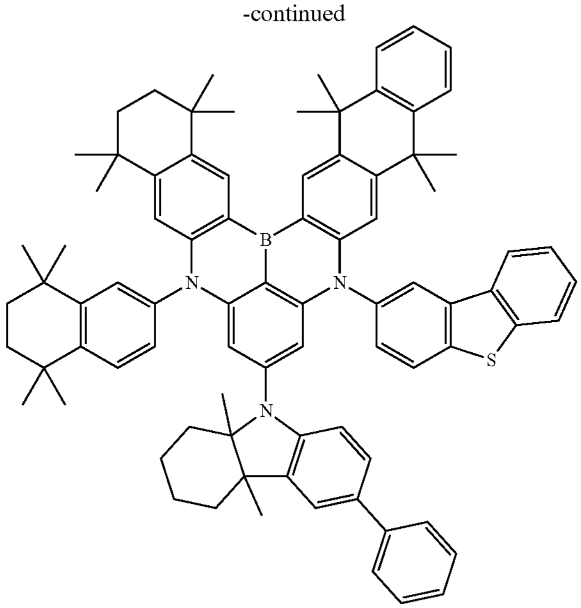
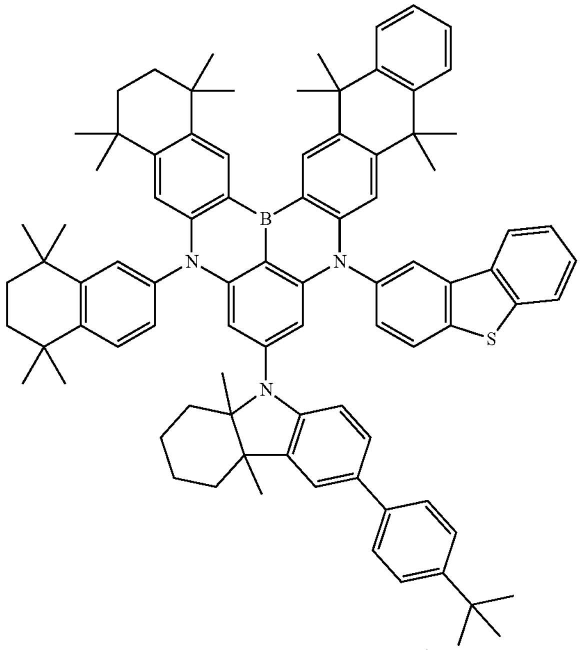
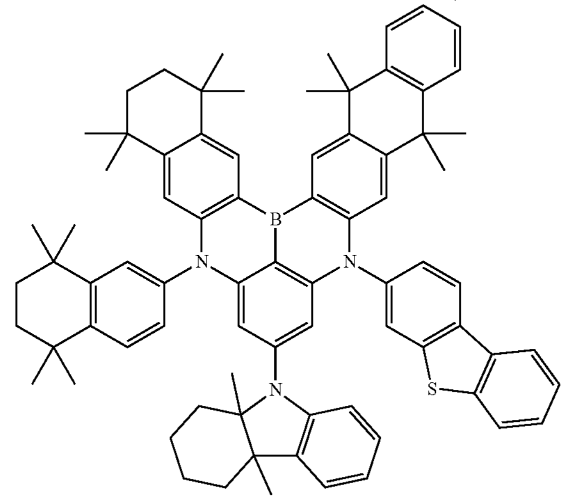
-continued
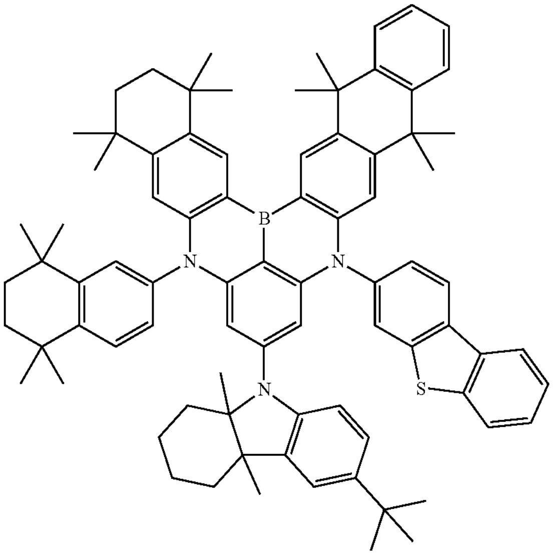
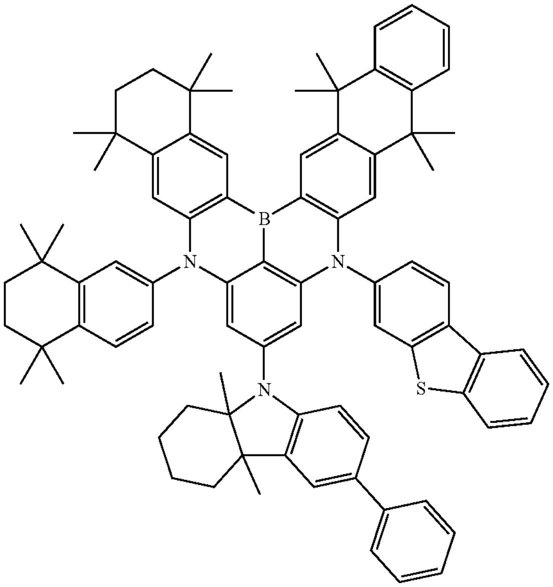

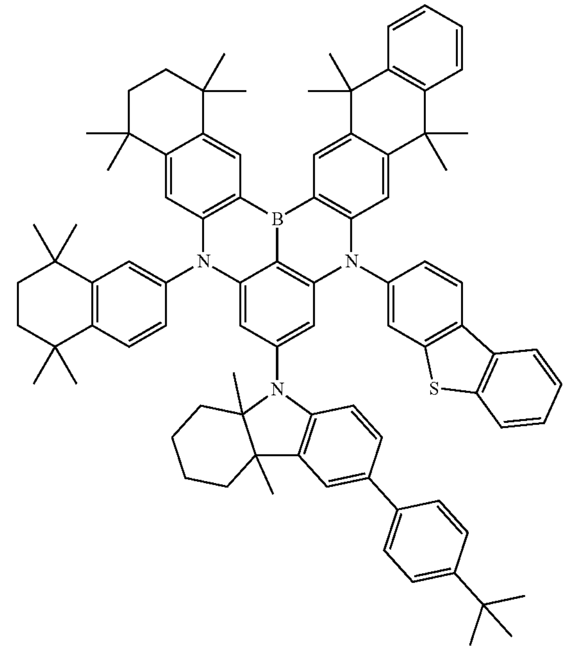
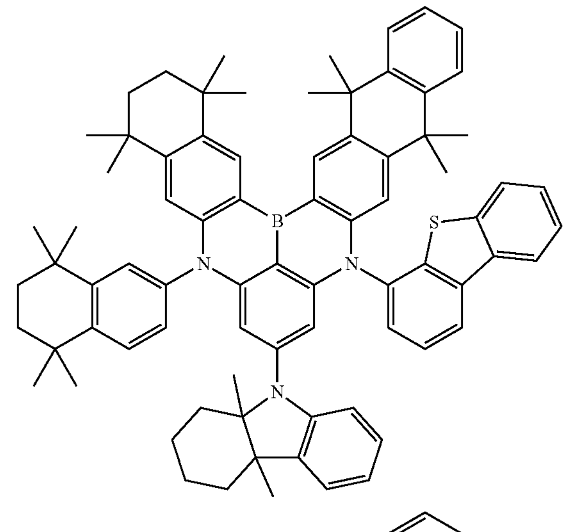
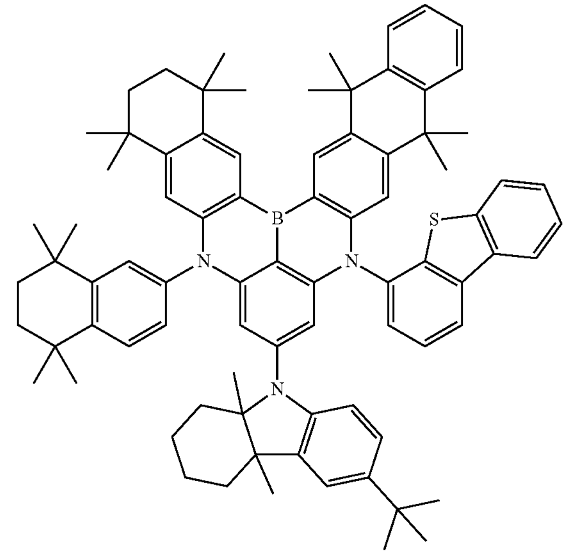
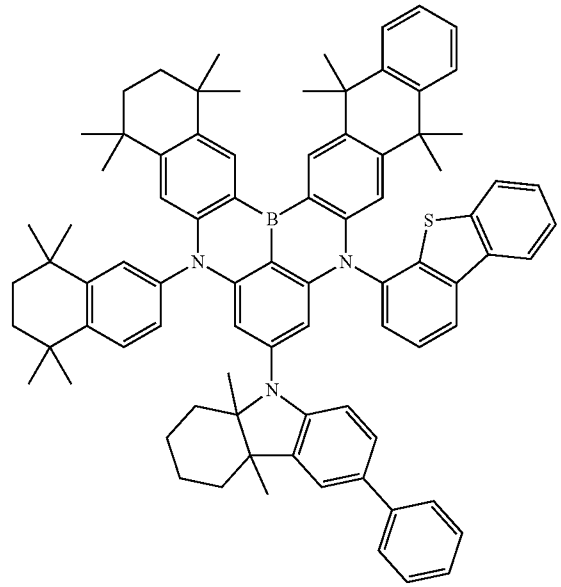
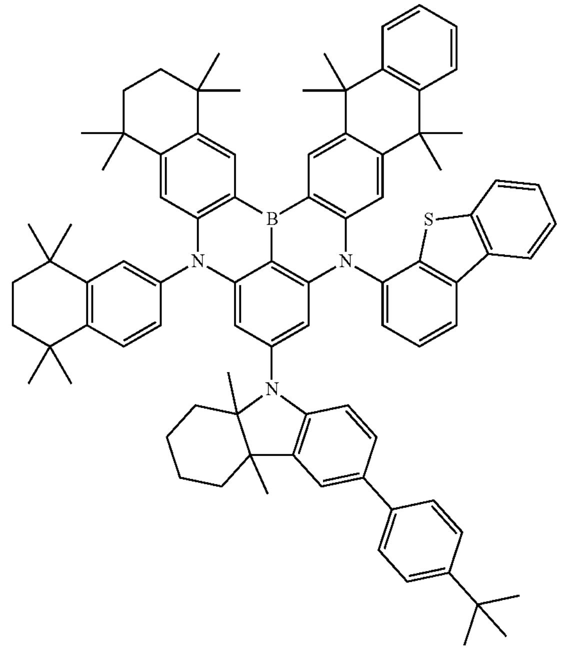
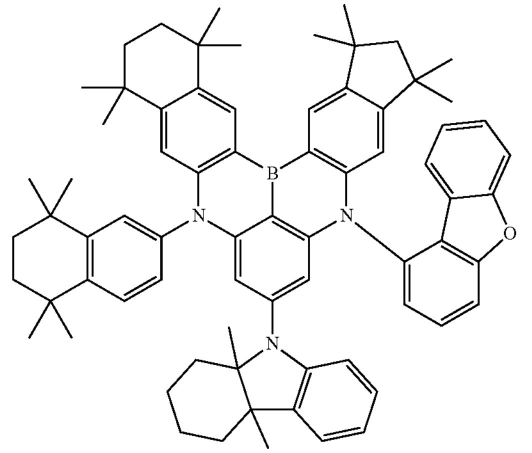

-continued
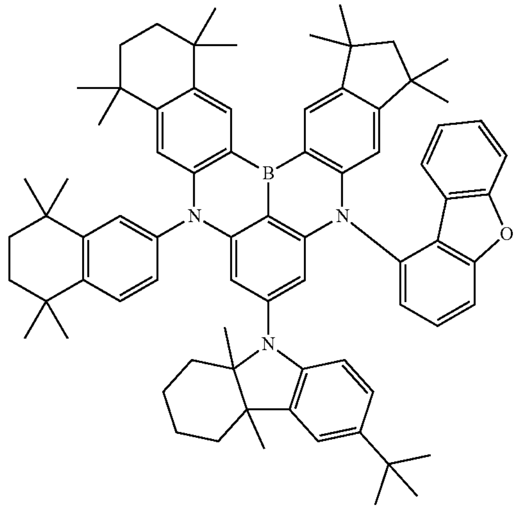
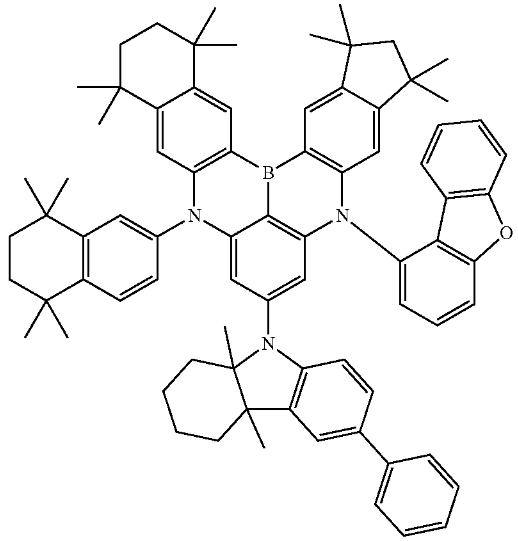
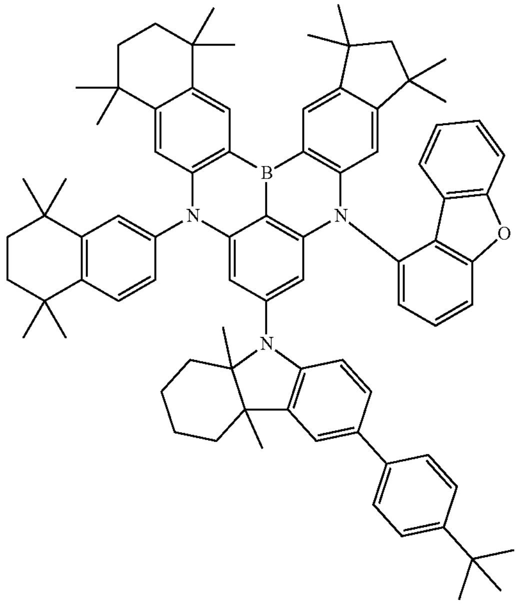
-continued
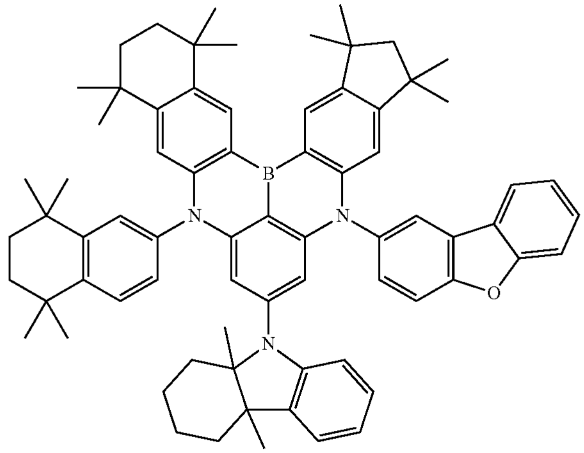
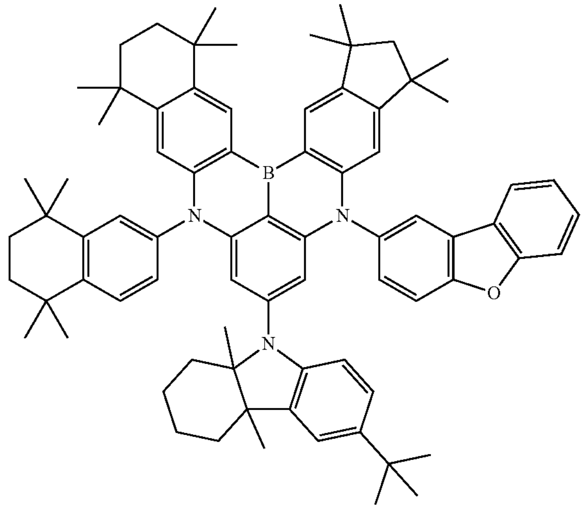
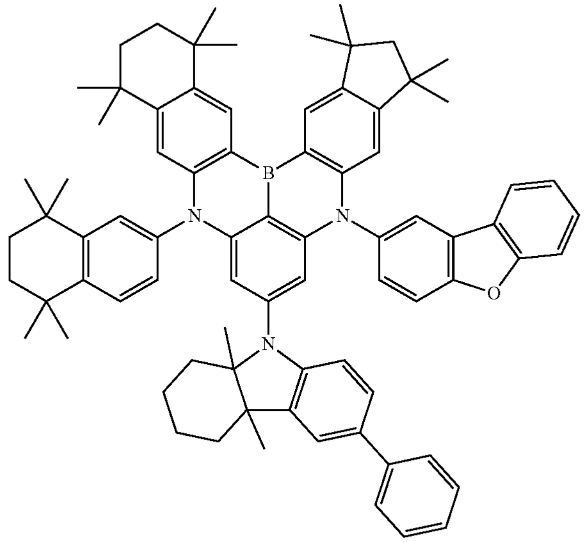

-continued
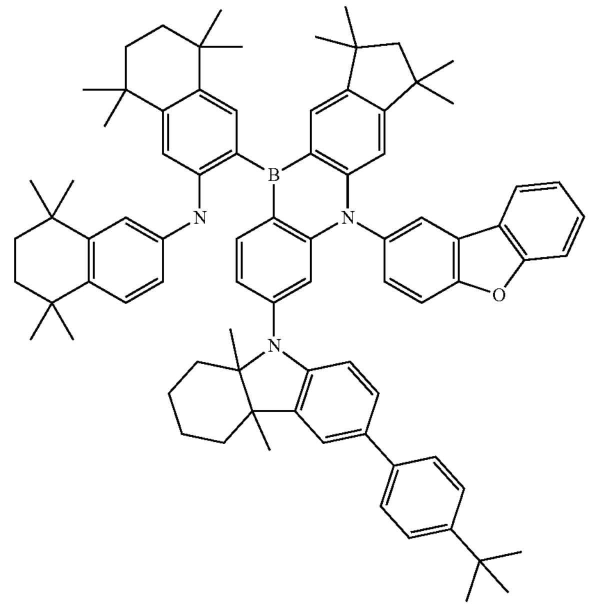
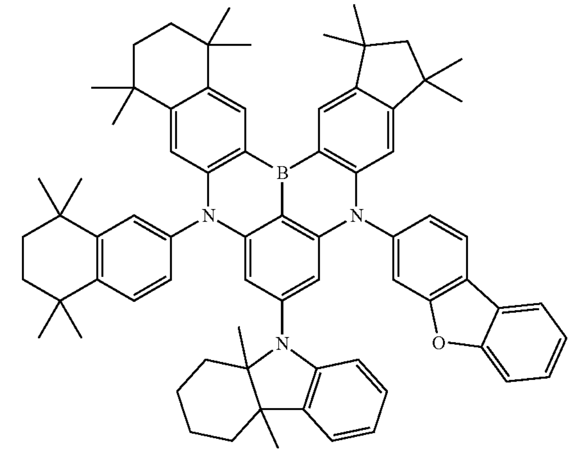
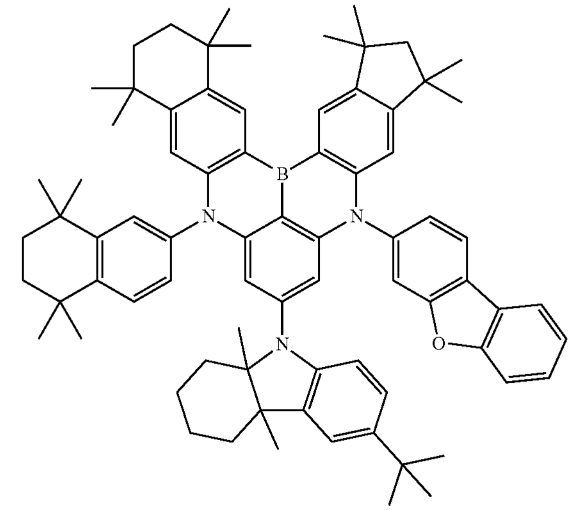
-continued
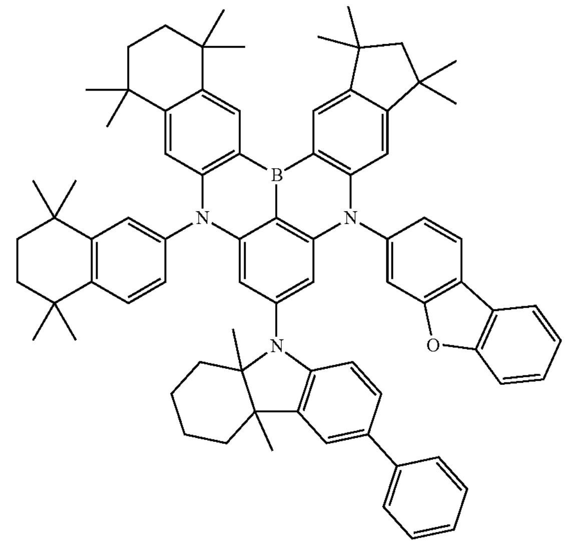
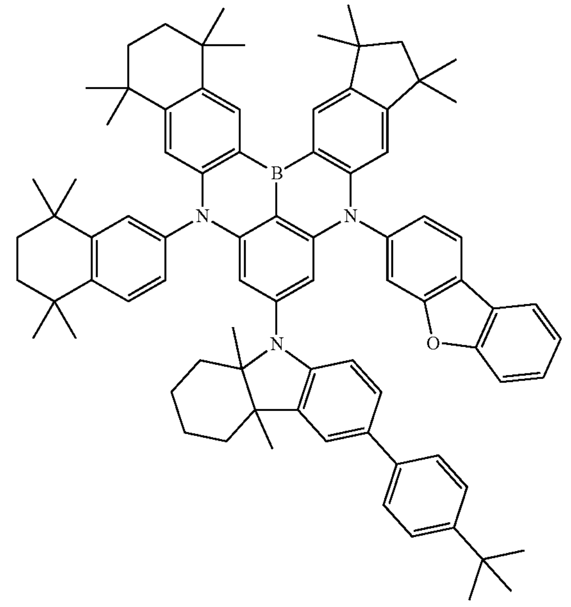
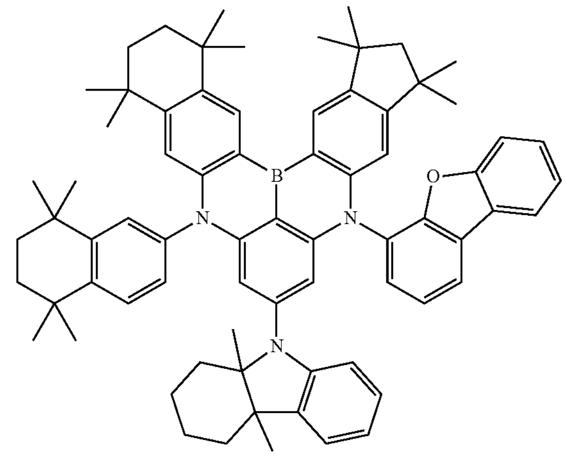

-continued
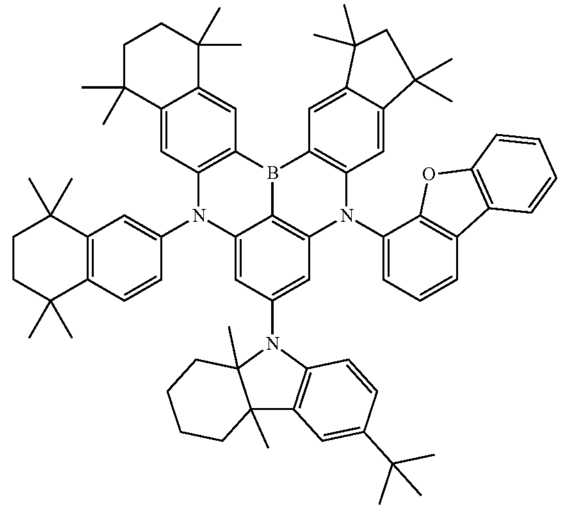
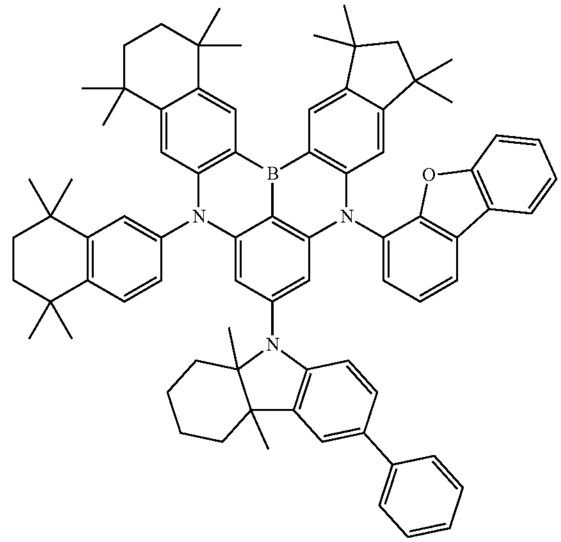
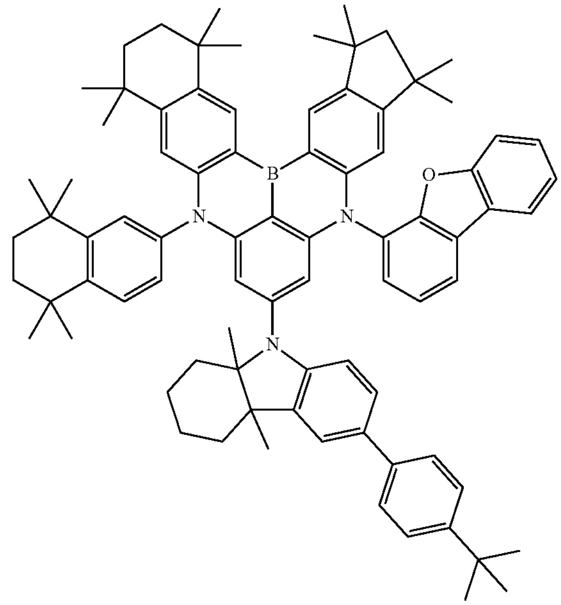
-continued
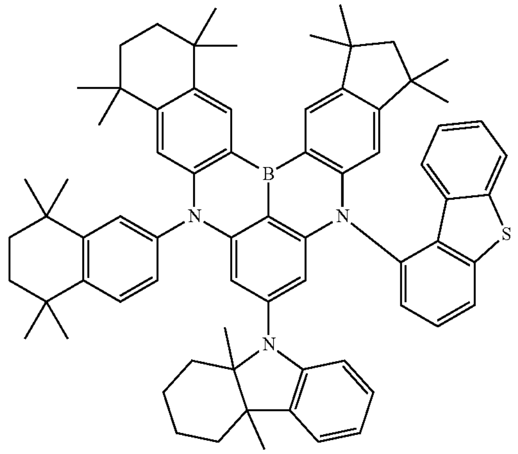
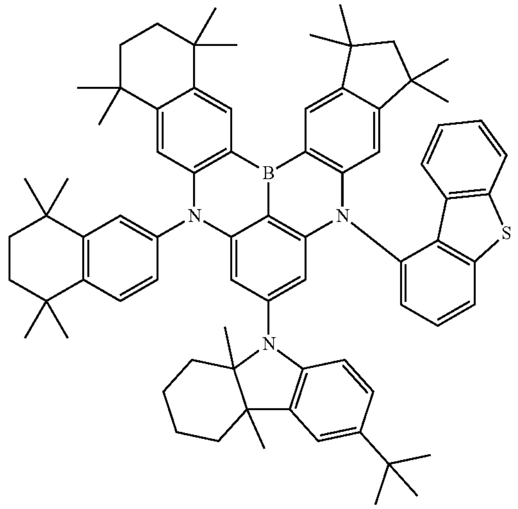
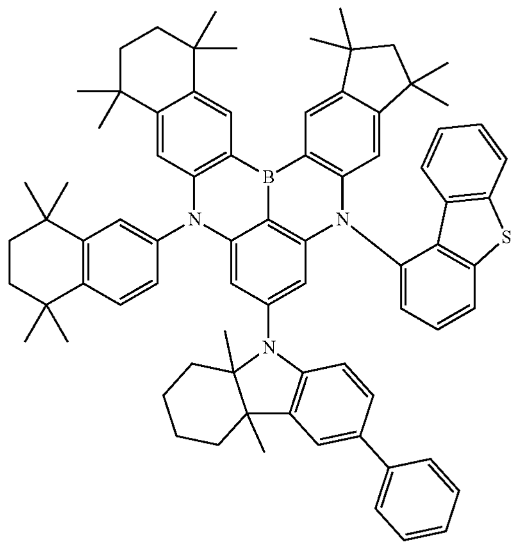

-continued
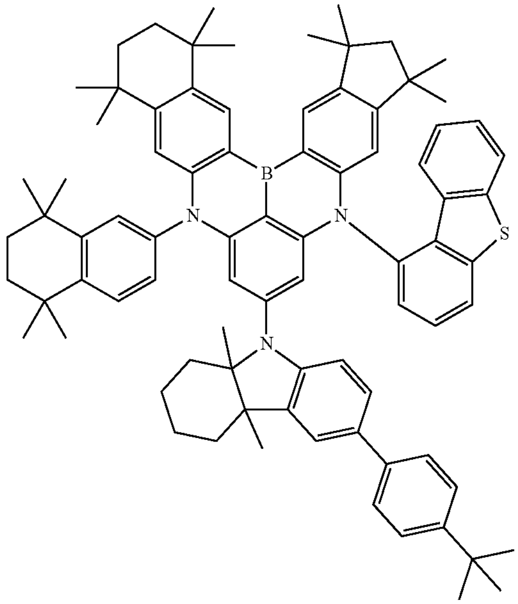
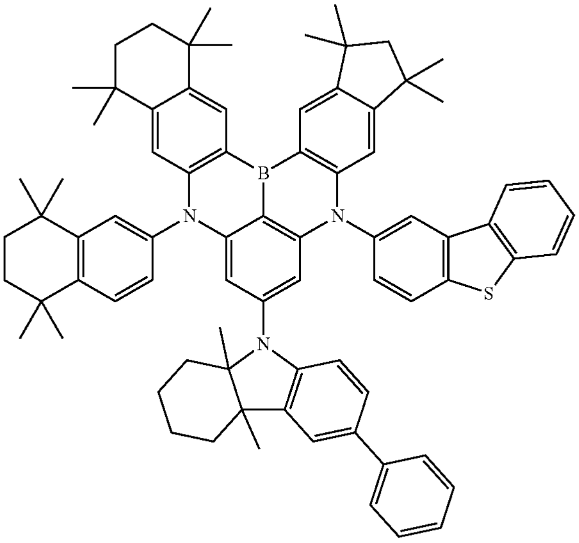
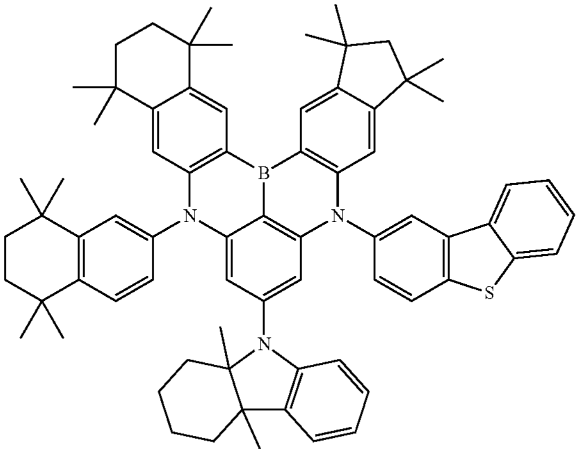
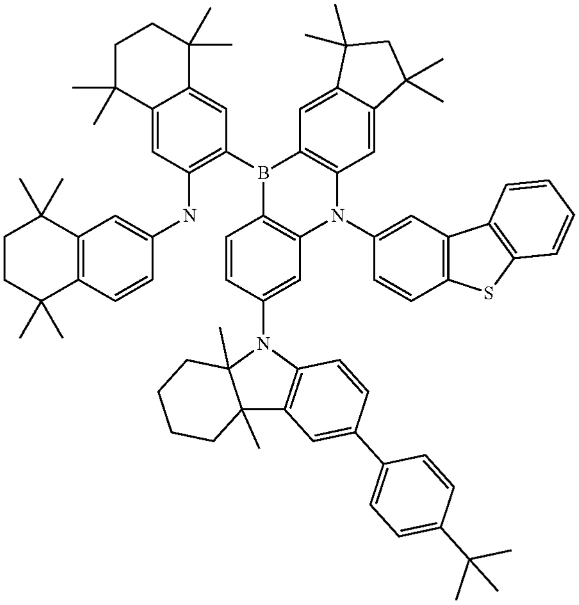
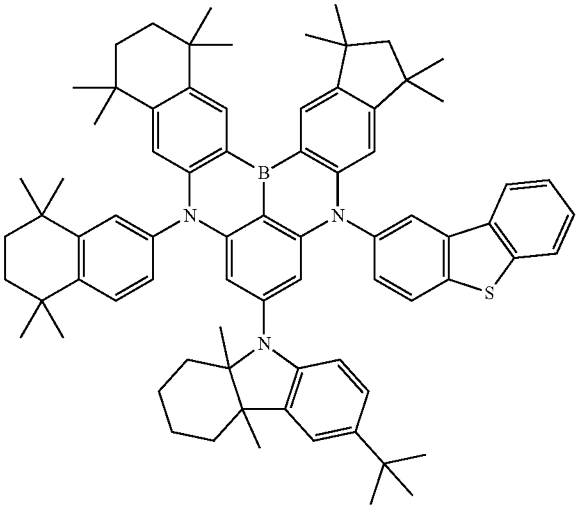
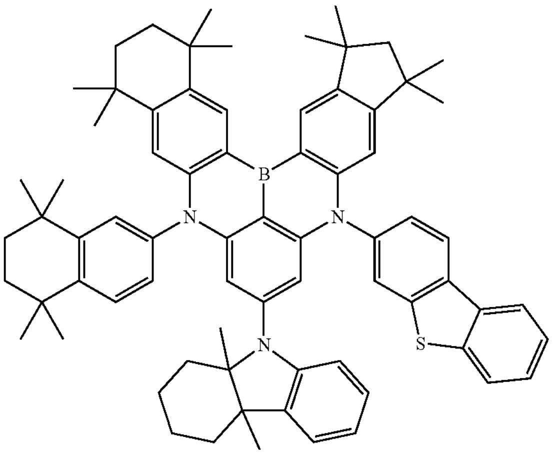

-continued
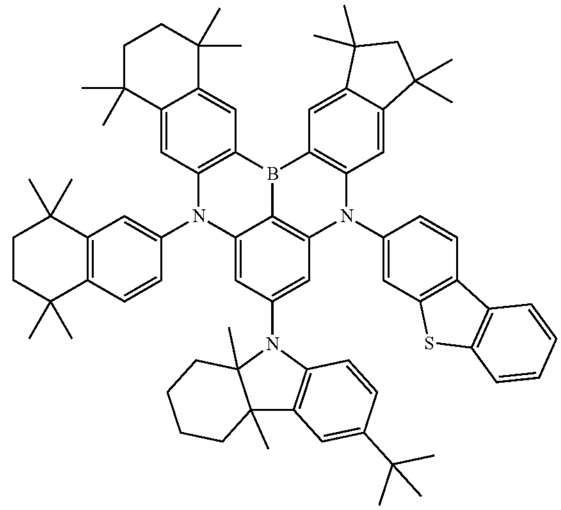
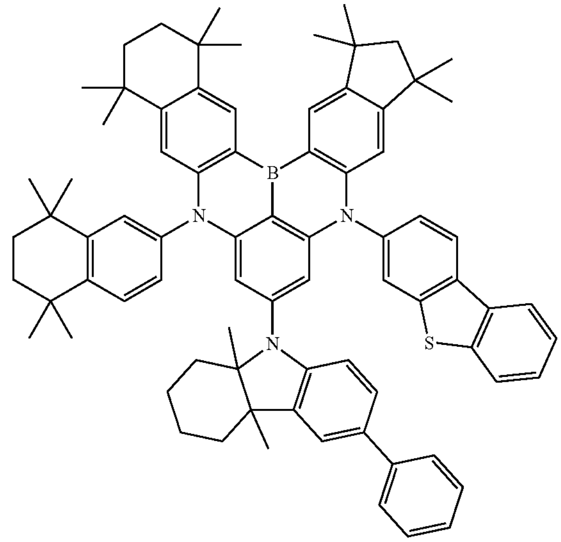
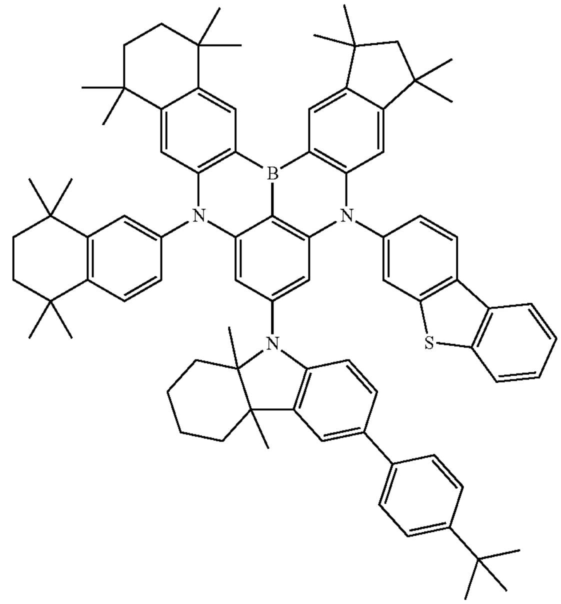
-continued
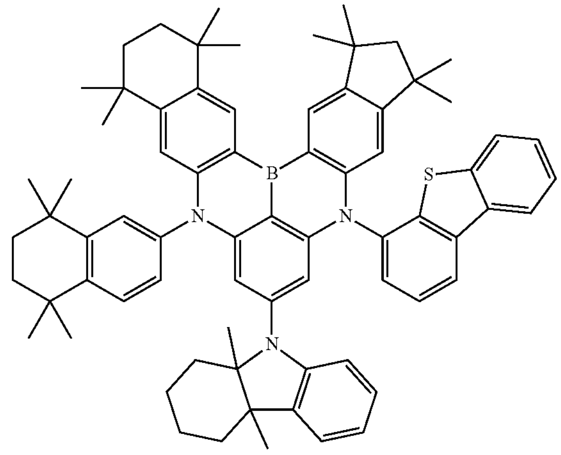
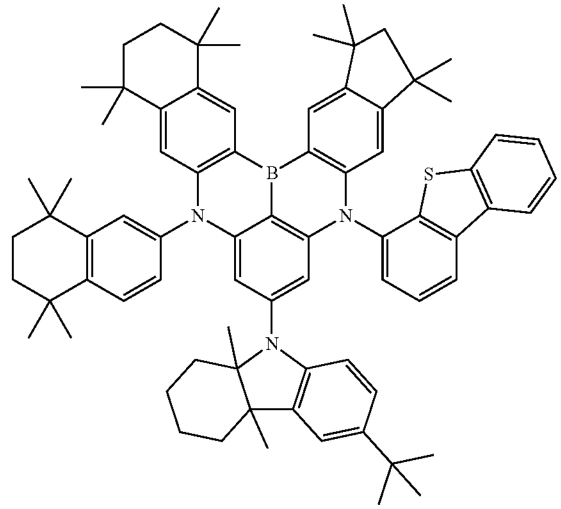
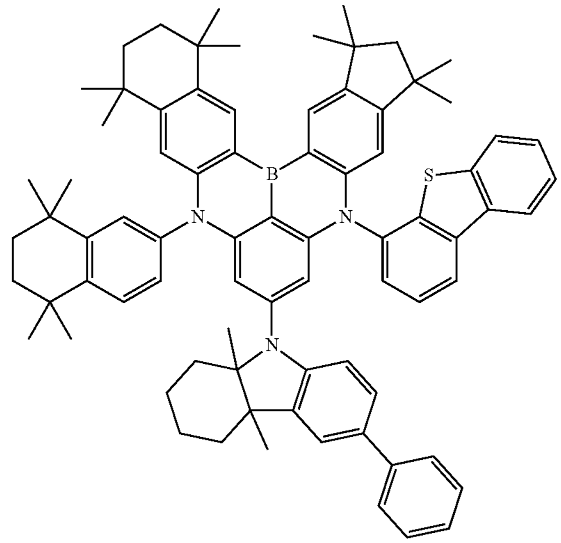

-continued
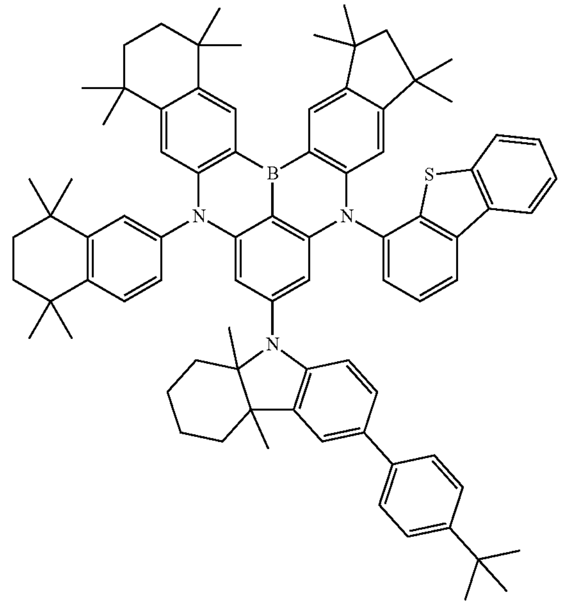
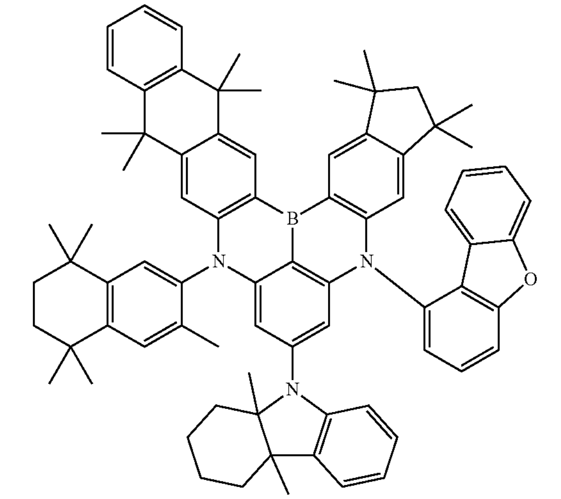
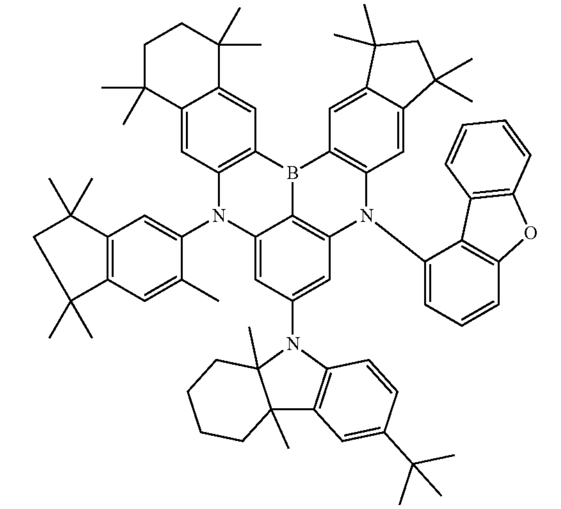
-continued
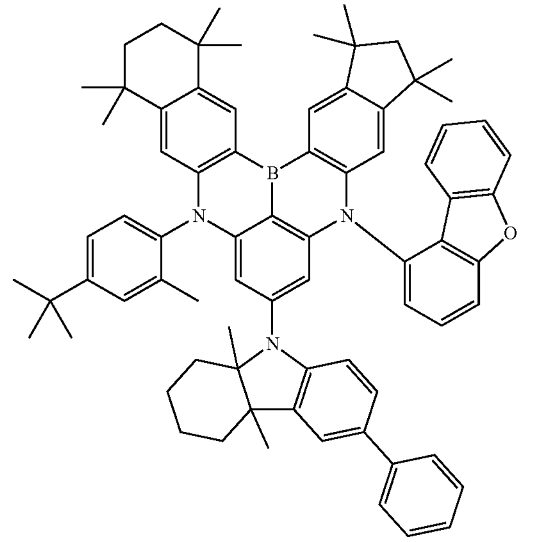
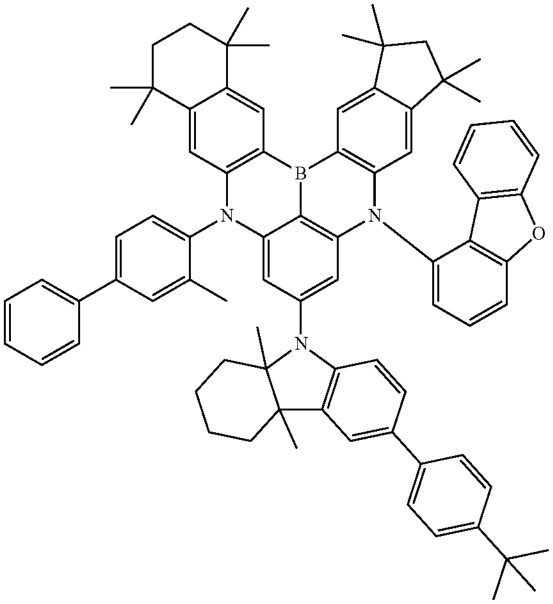
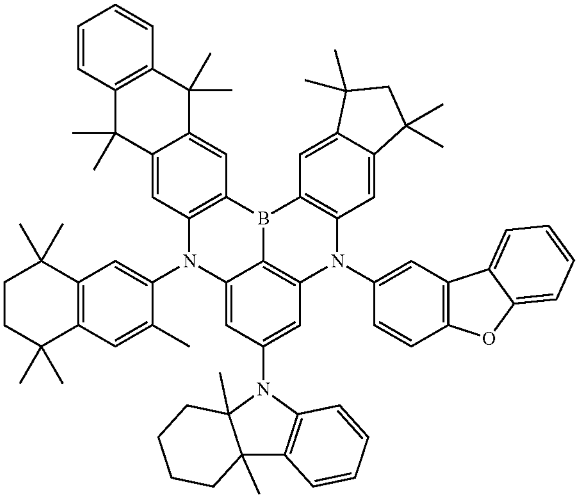

-continued
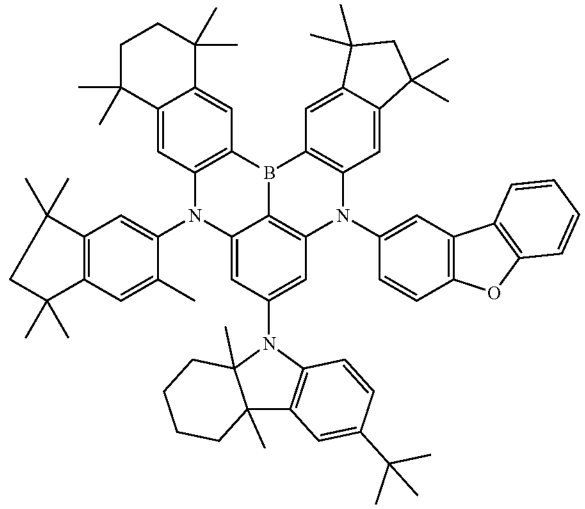
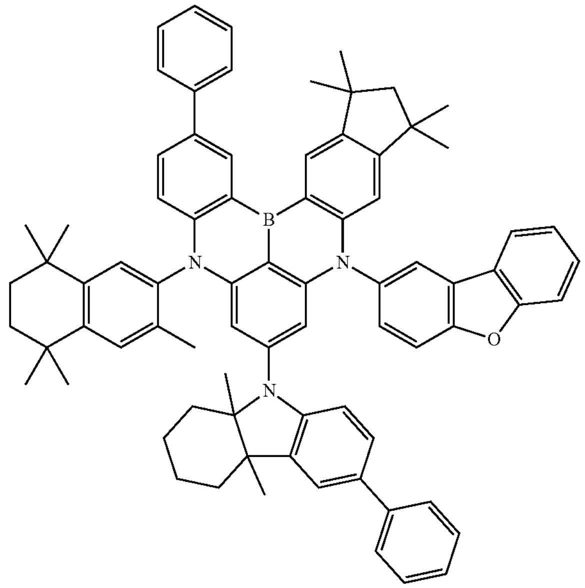
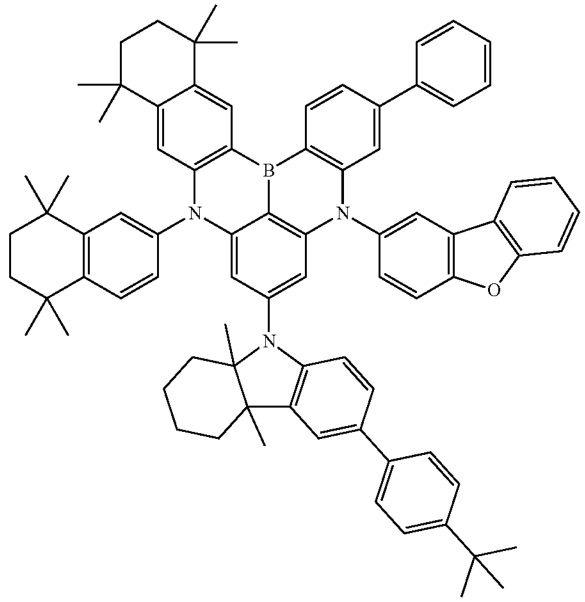
-continued
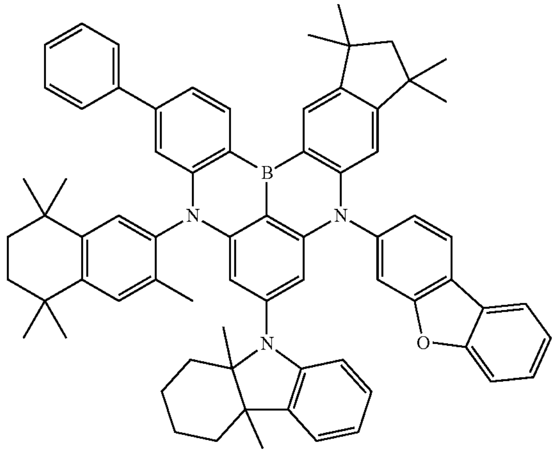
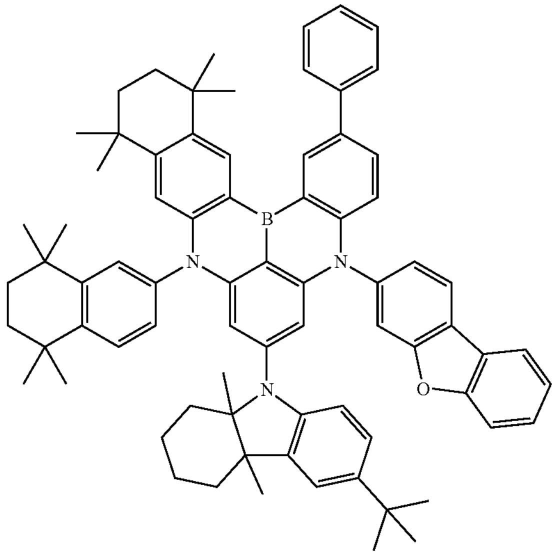
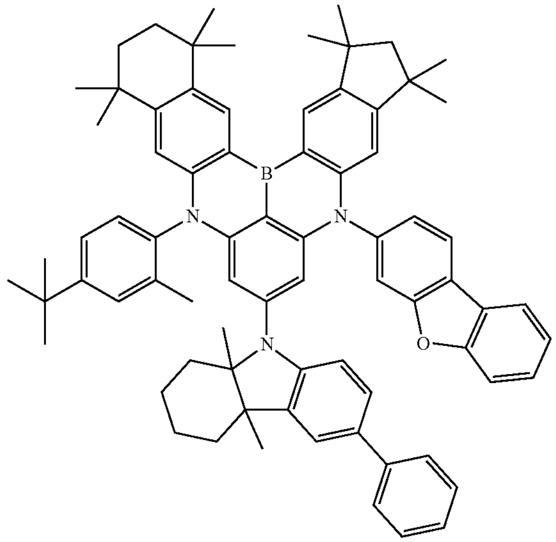

-continued
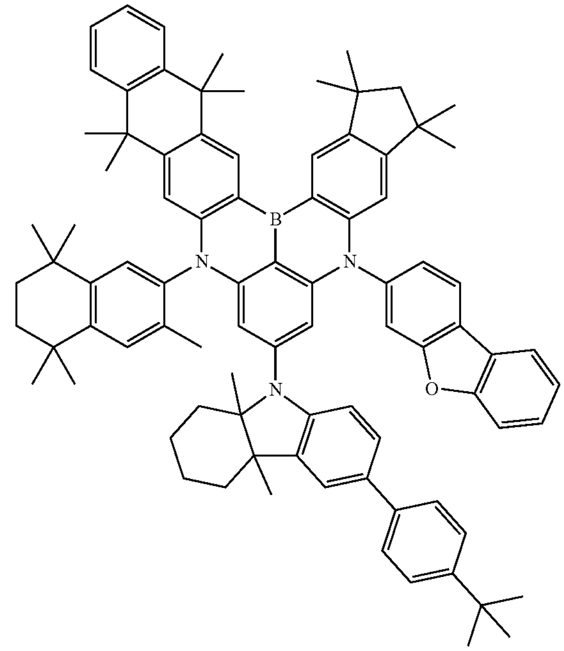
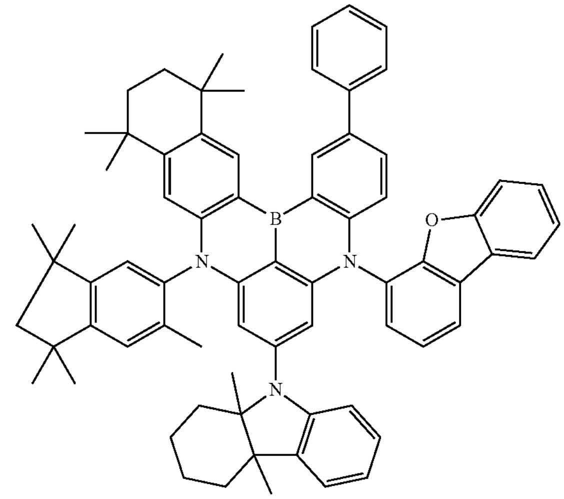
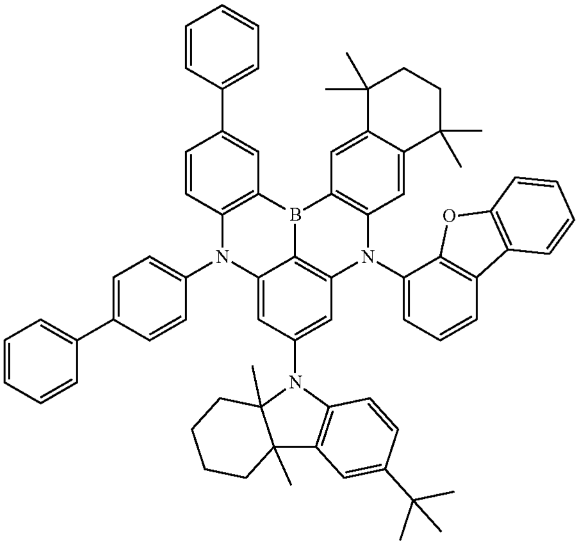
-continued
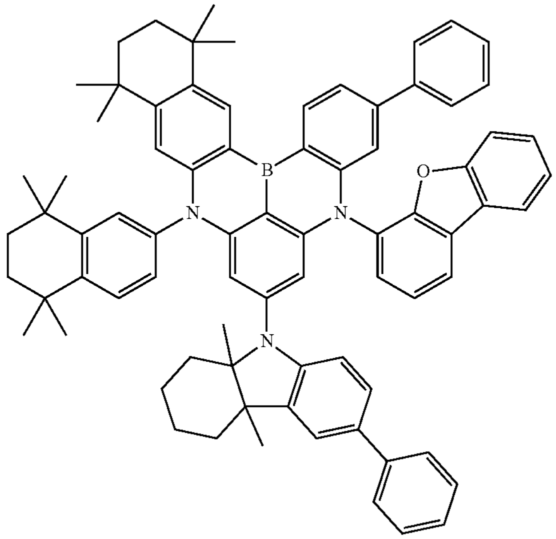
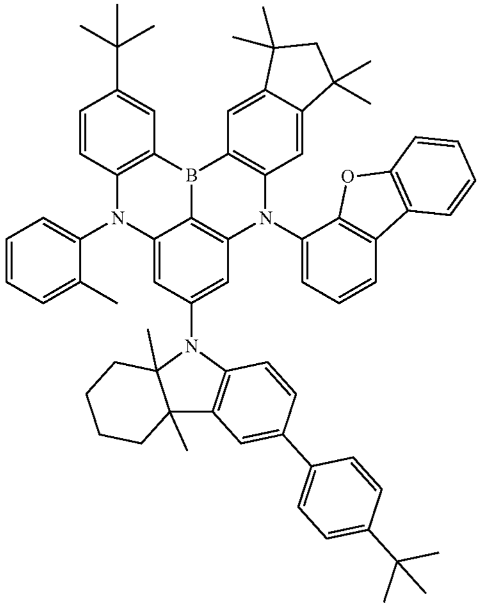 [SMILES: Cc1ccccc1N1c2ccc(C(C)(C)C)cc2B2c3cc4c(cc3N(c3cccc5c3oc3ccccc35)c3cc(N5c6ccc(-c7ccc(C(C)(C)C)cc7)cc6C6(C)CCCCC56C)cc1c32)C(C)(C)CC4(C)C]

-continued
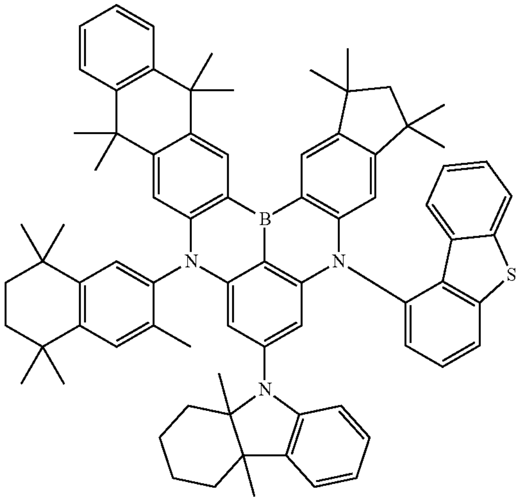
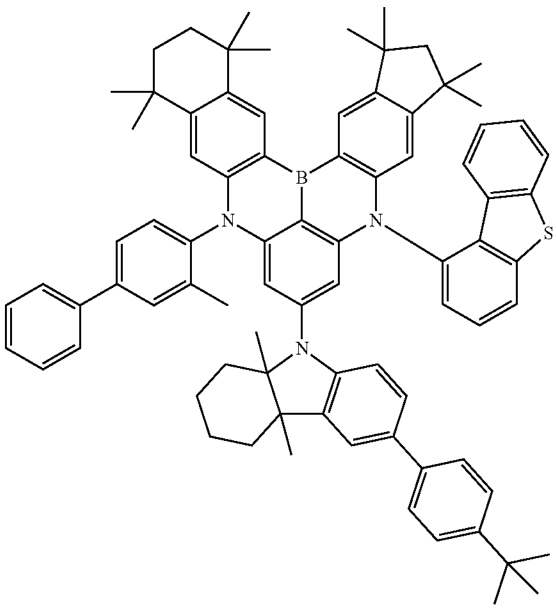
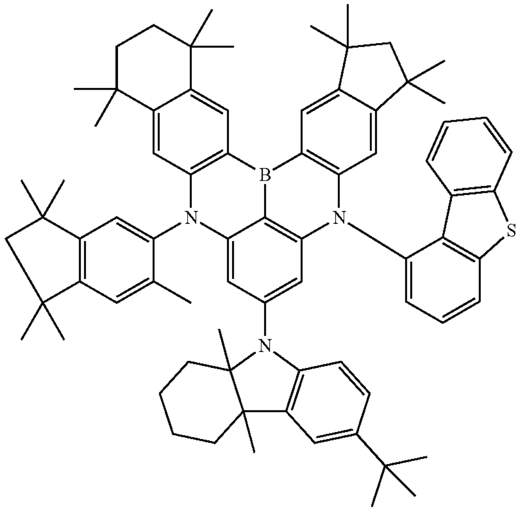
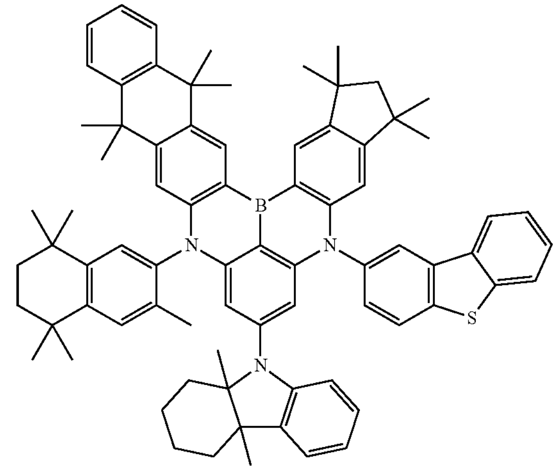
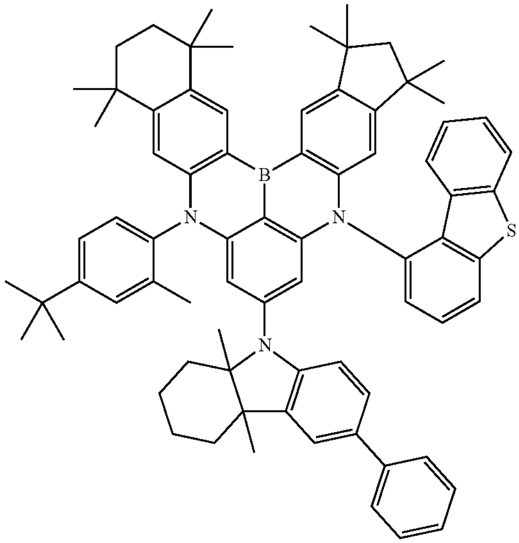
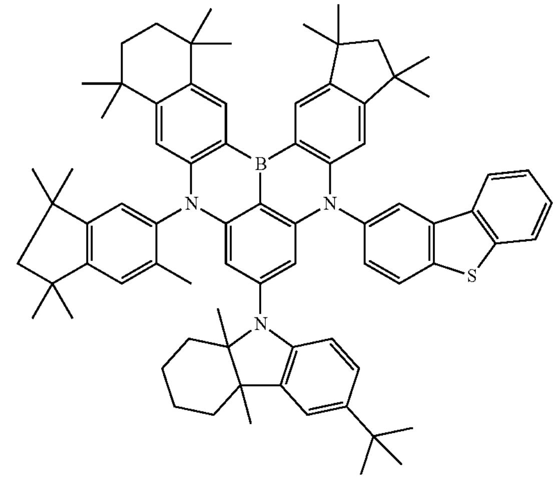

-continued
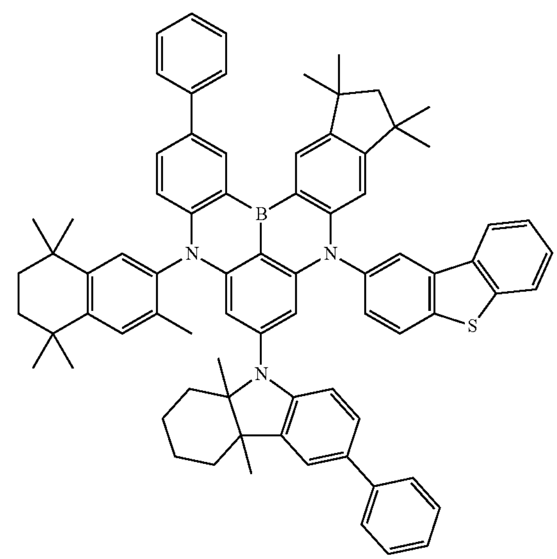
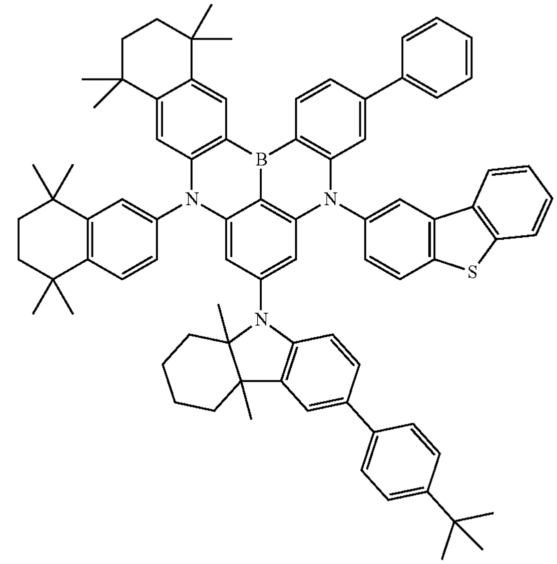
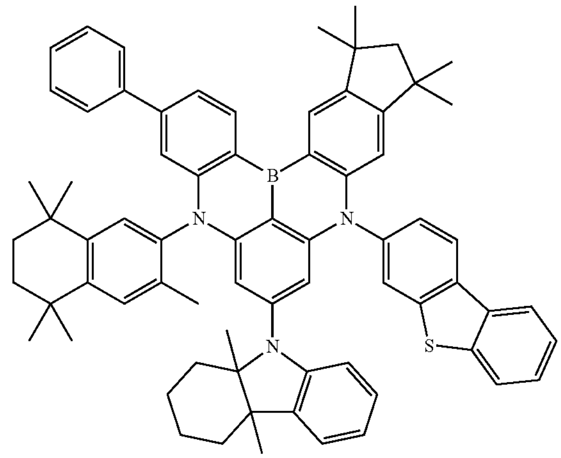
-continued
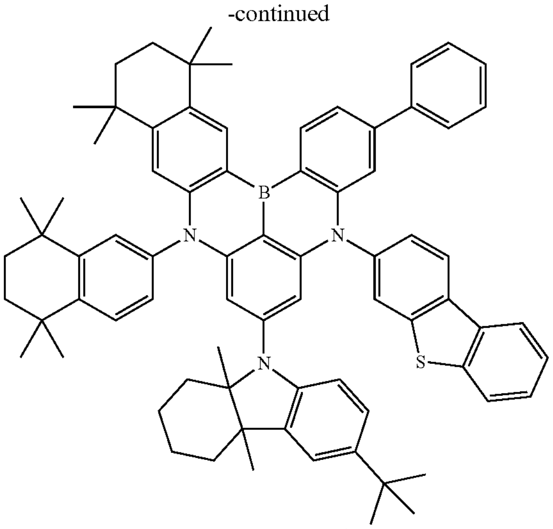
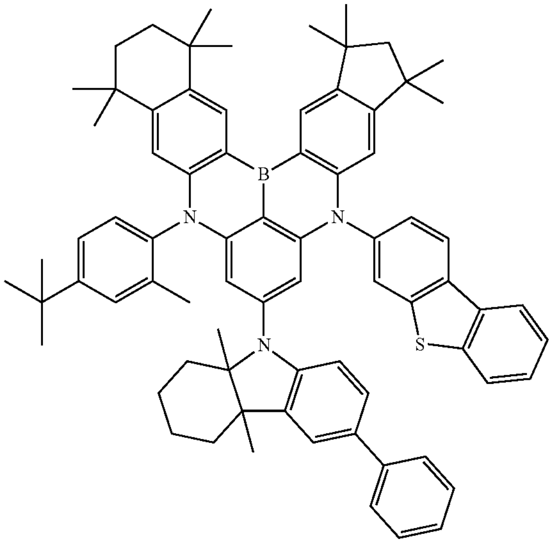
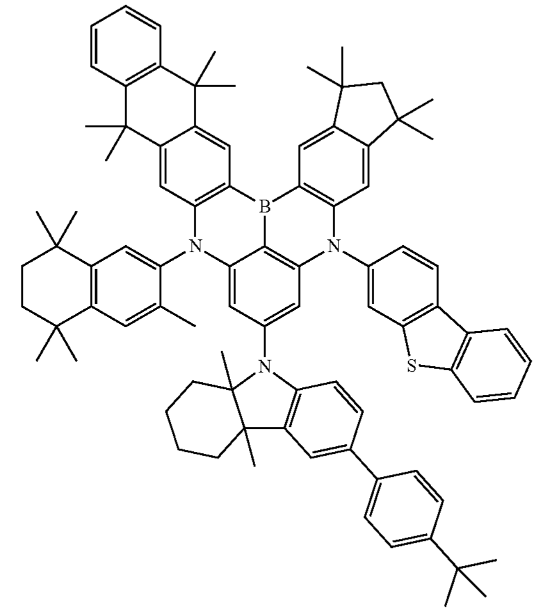

-continued
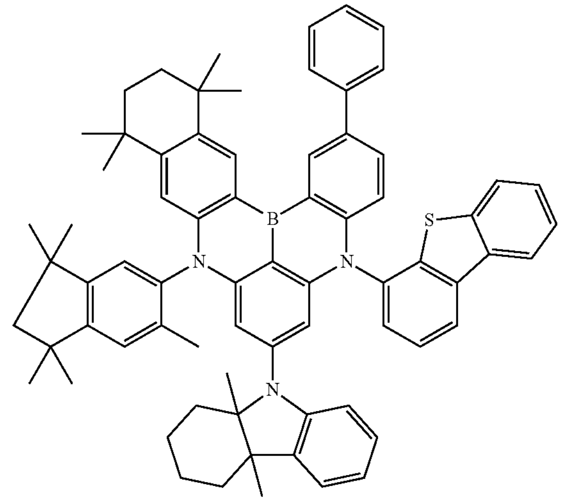
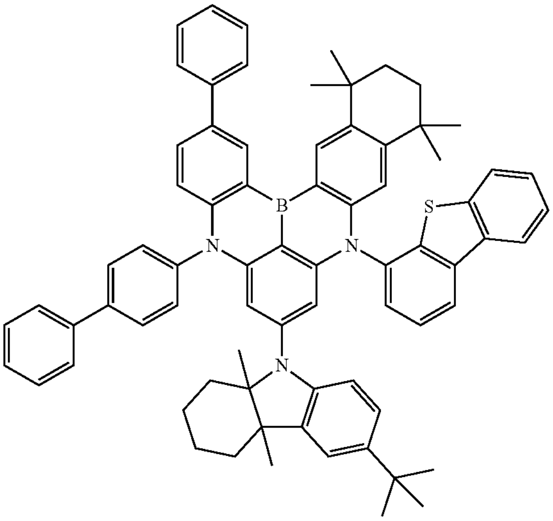
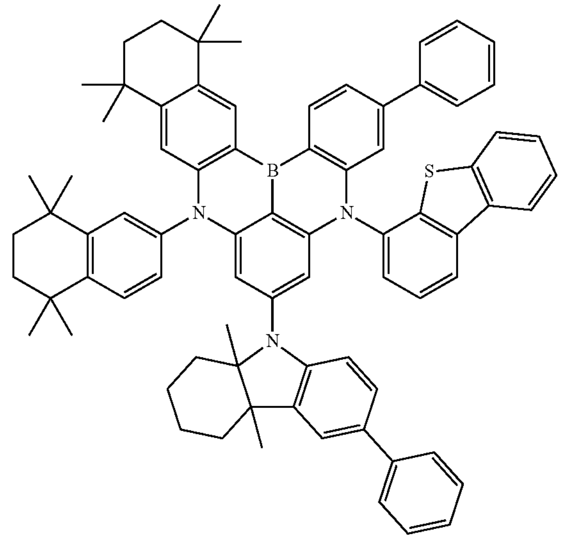
-continued
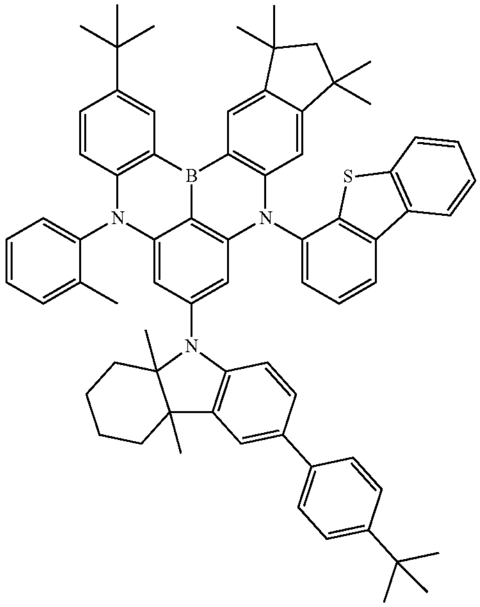
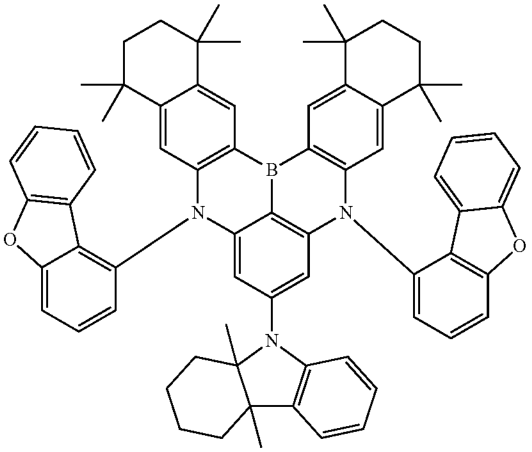
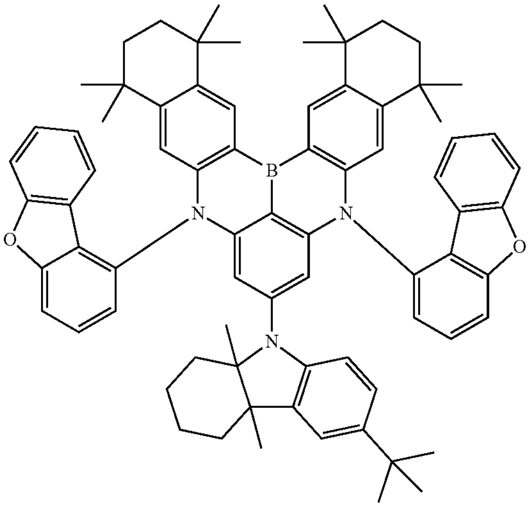

-continued
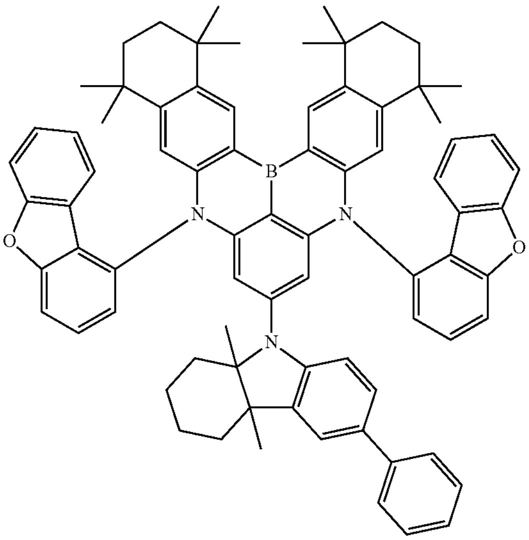
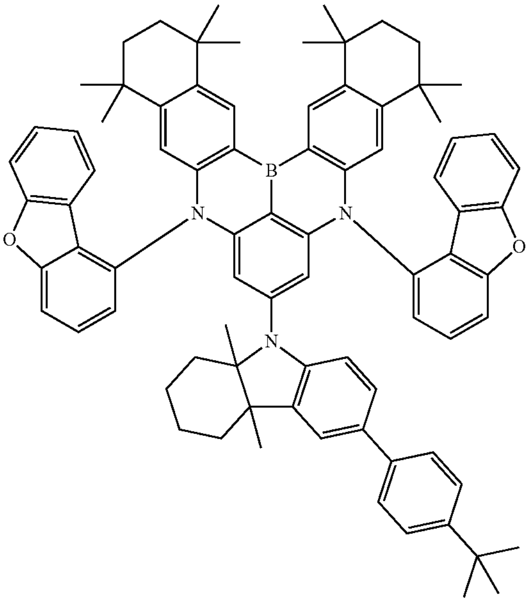
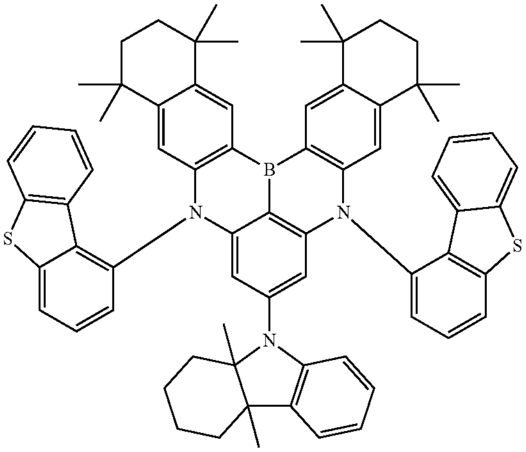
-continued
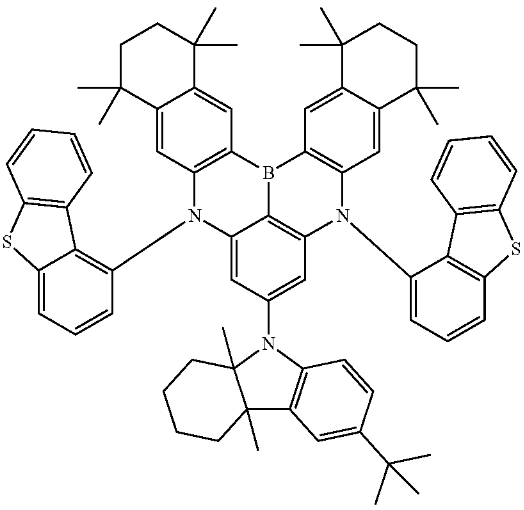
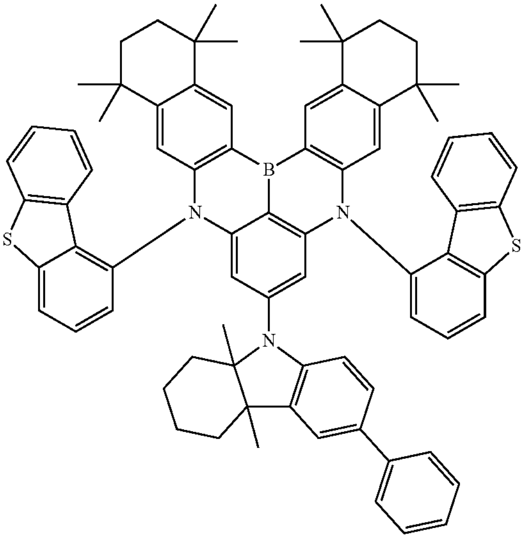
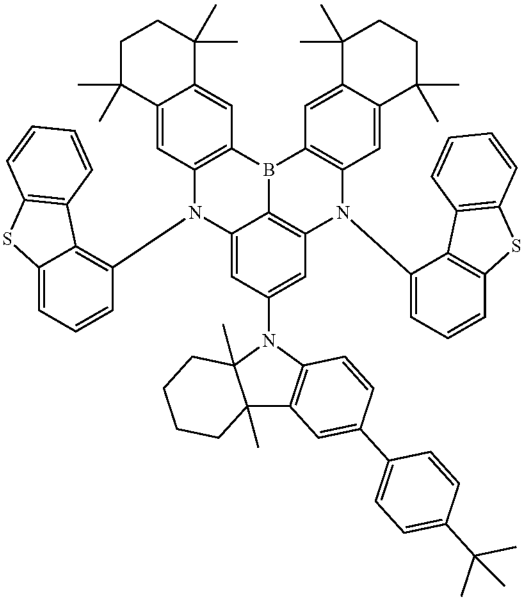

-continued
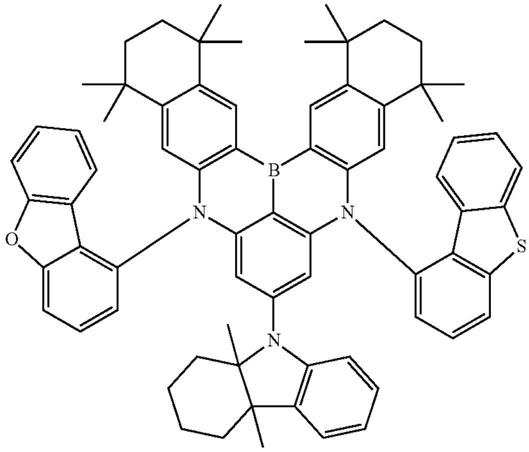
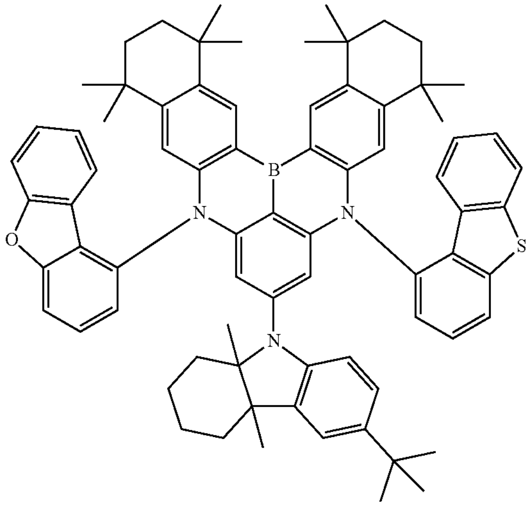
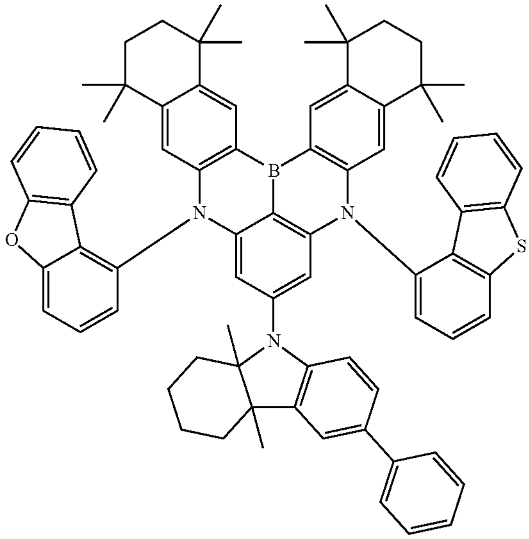
-continued
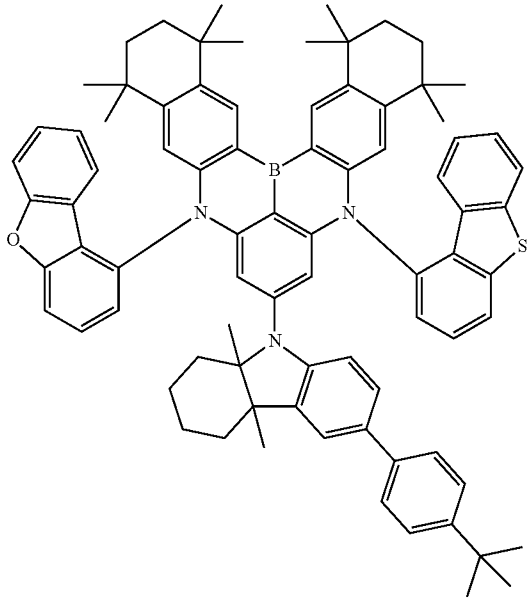
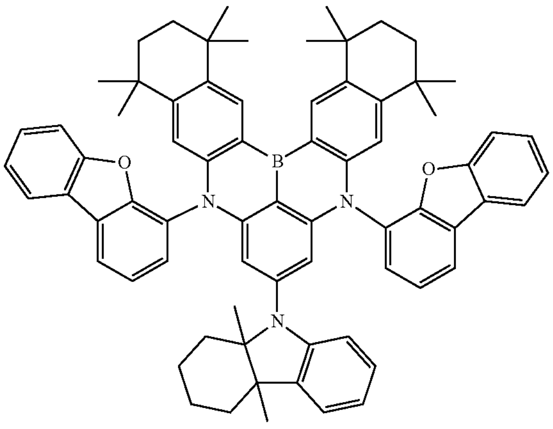
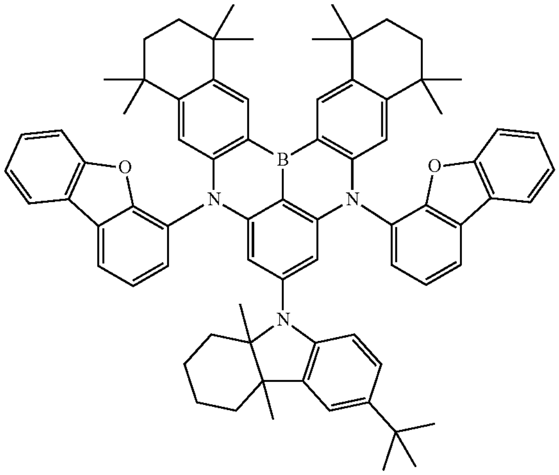

-continued
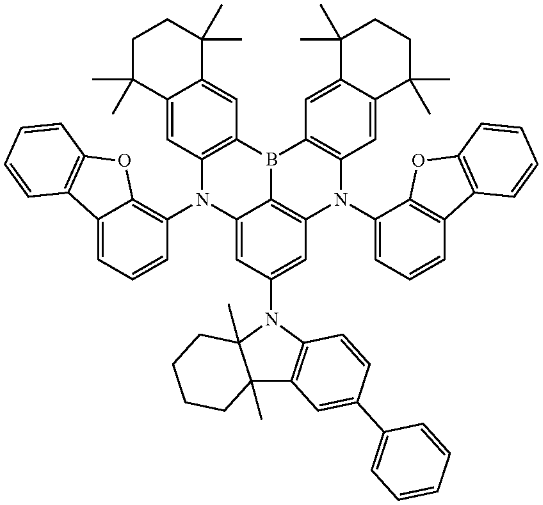
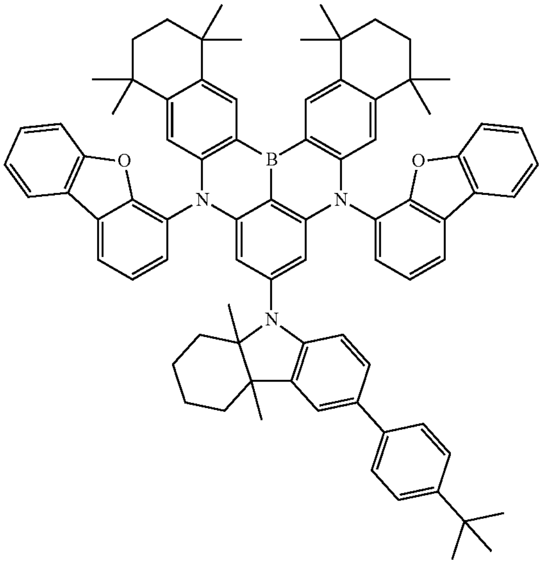
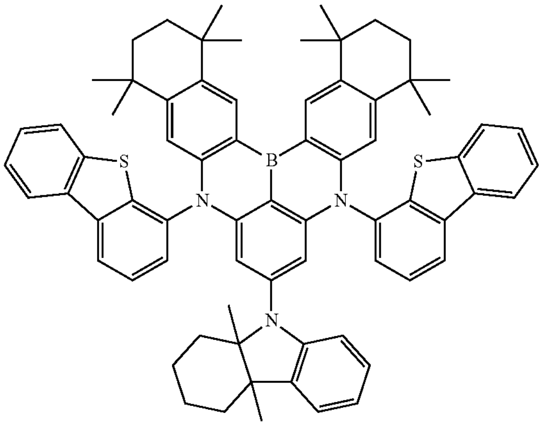
-continued
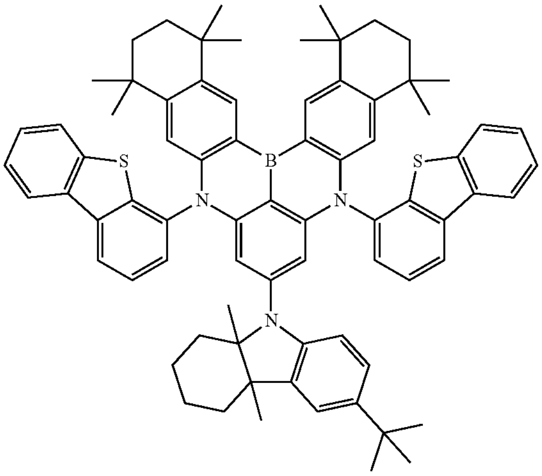
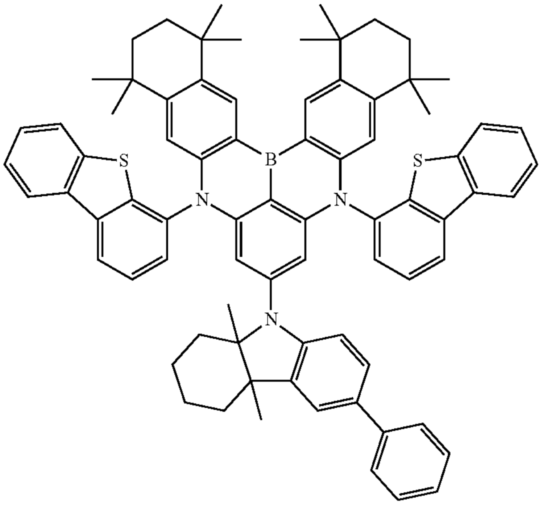
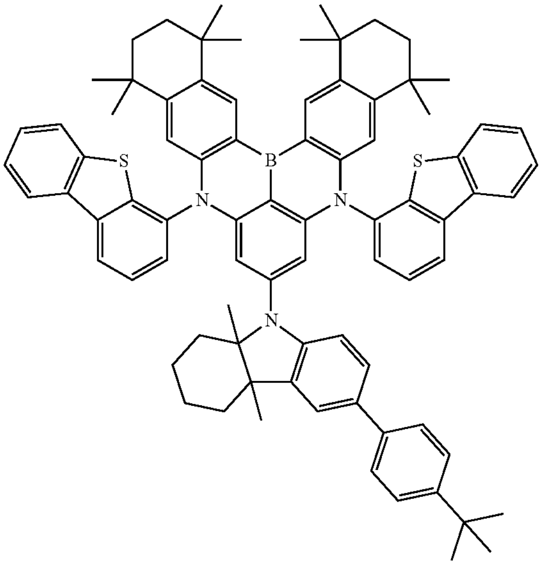

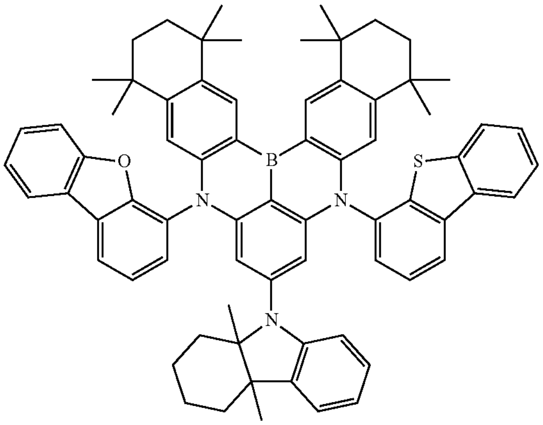
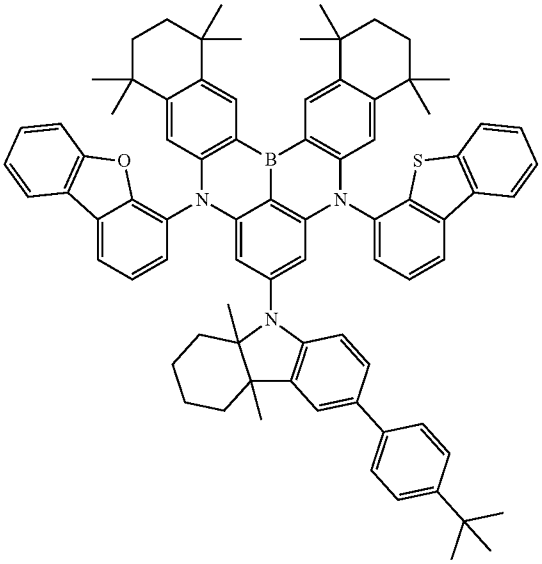
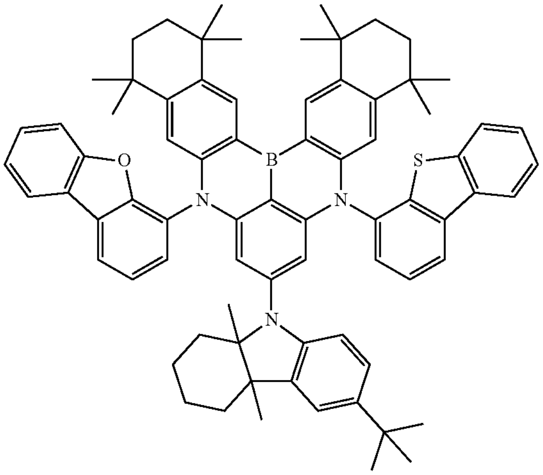
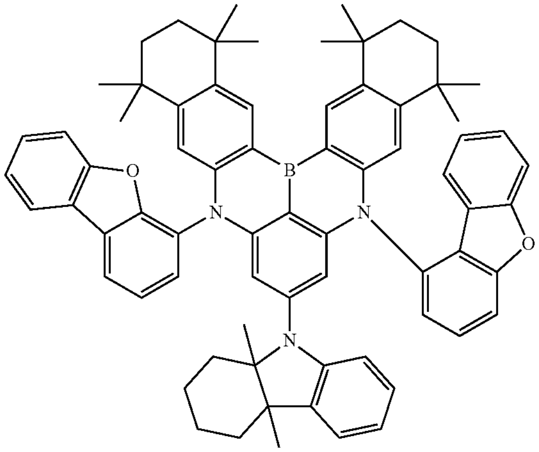
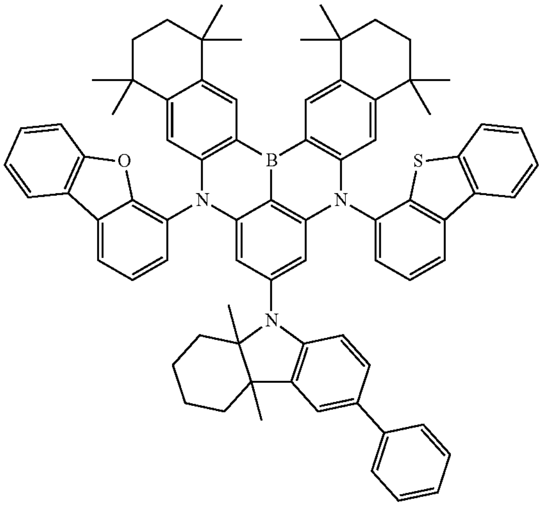
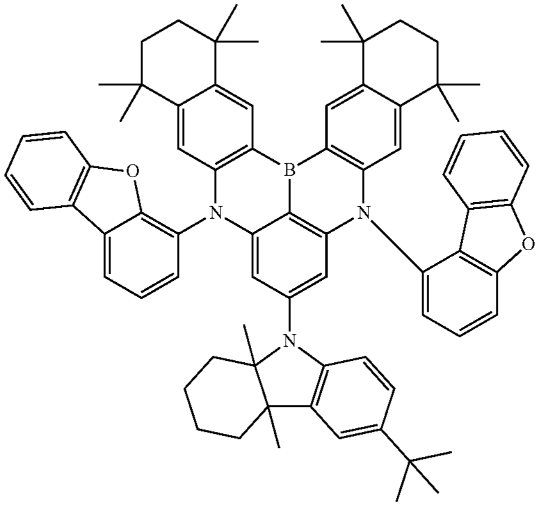

-continued
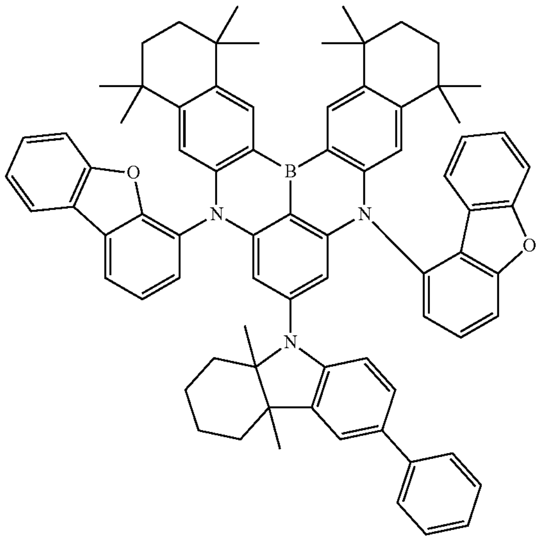
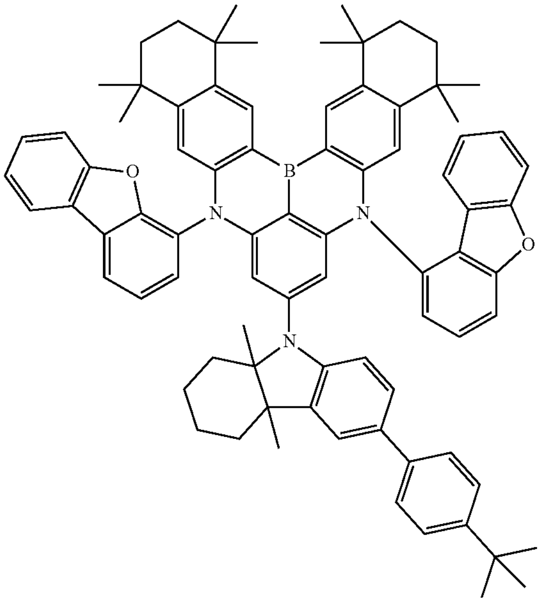
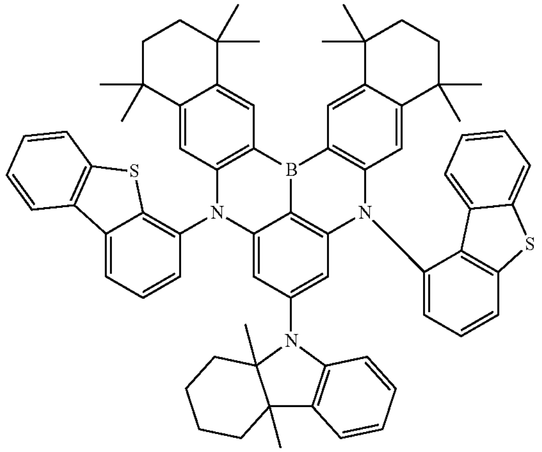
-continued
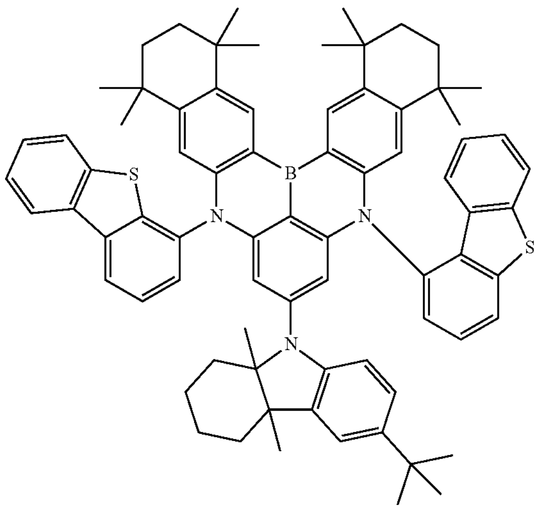
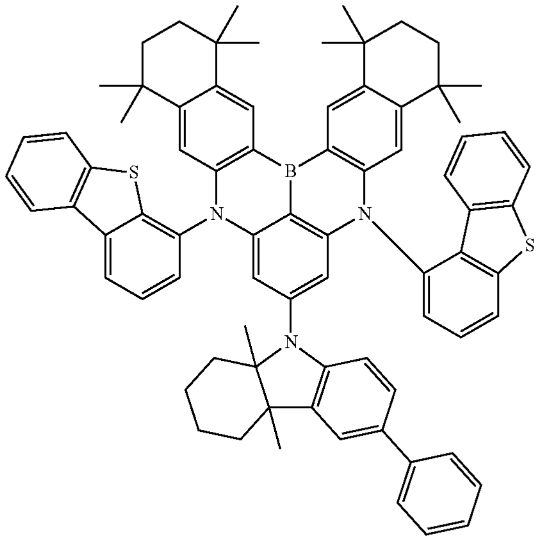
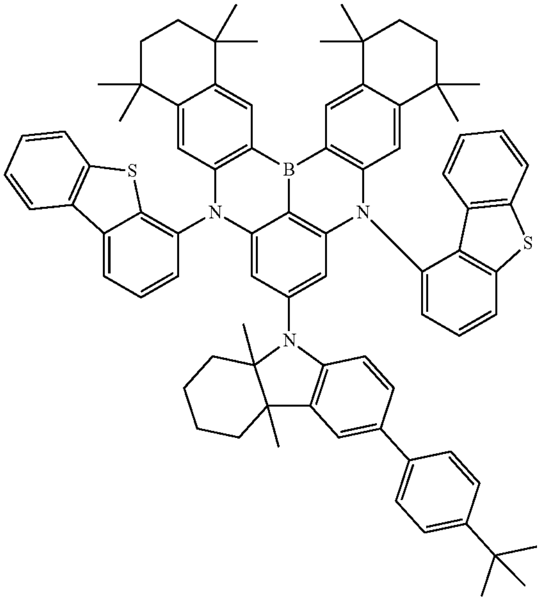

-continued
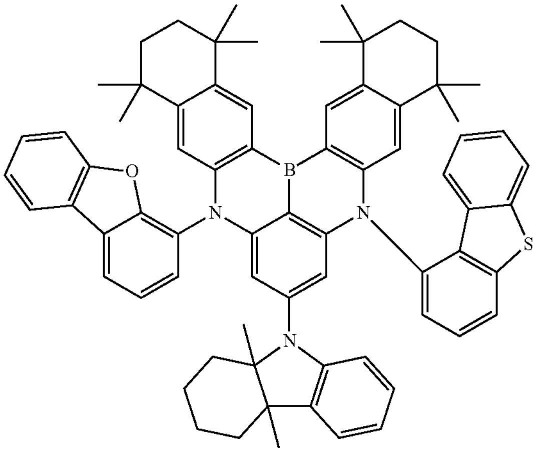
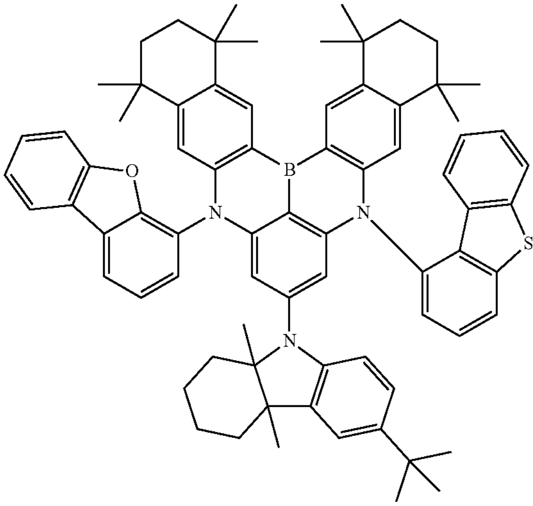
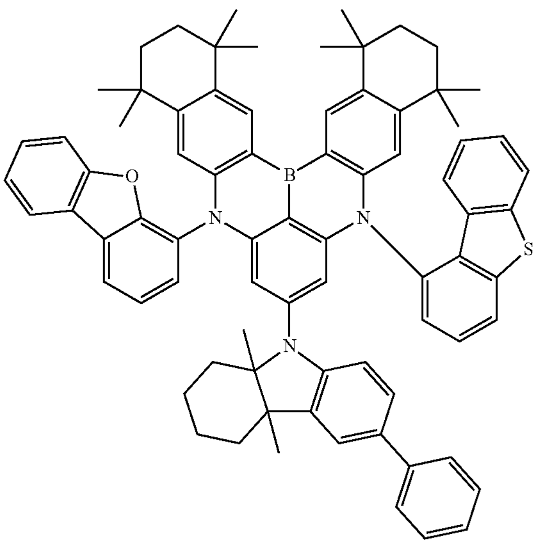
-continued
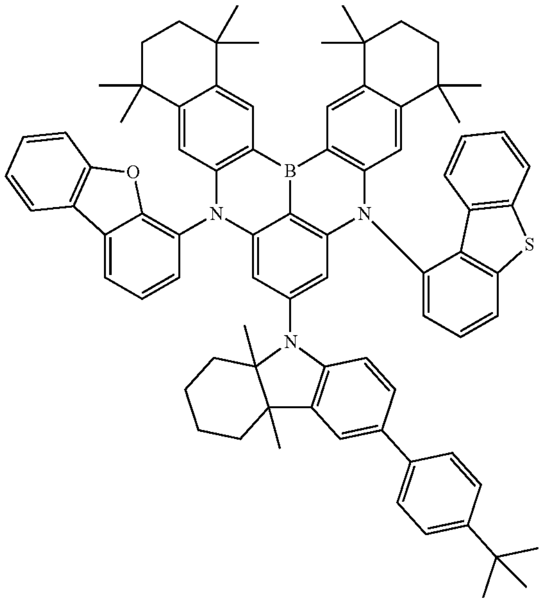
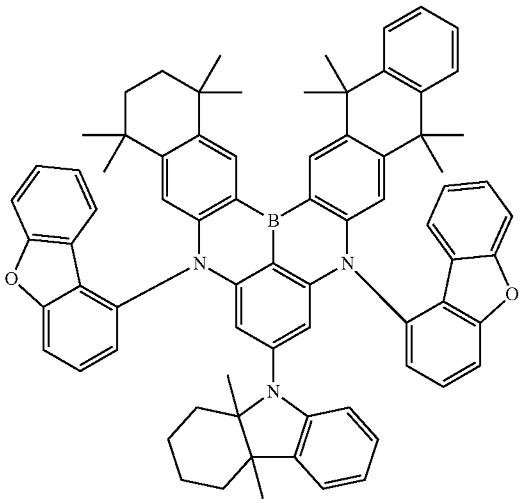
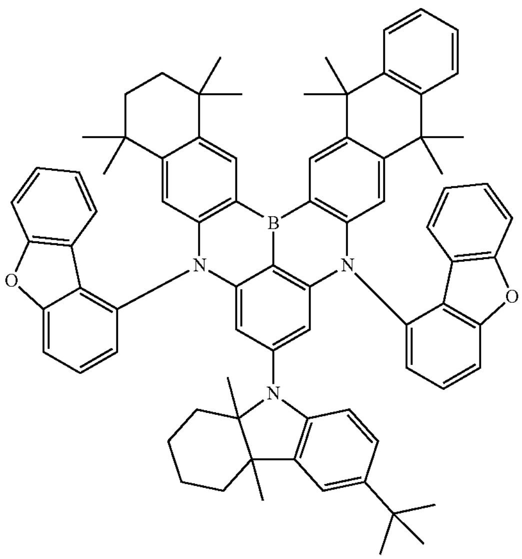

-continued
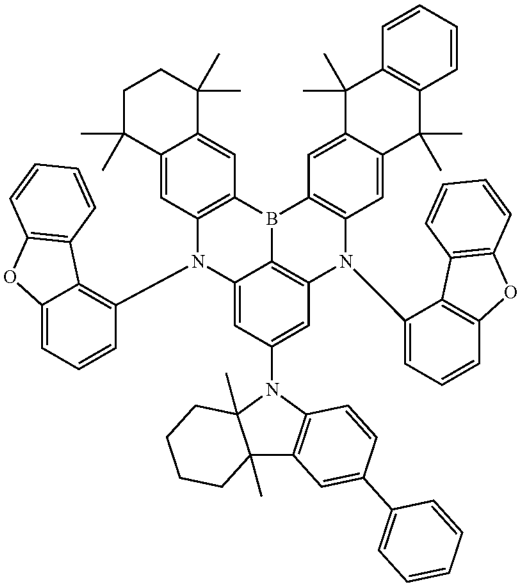
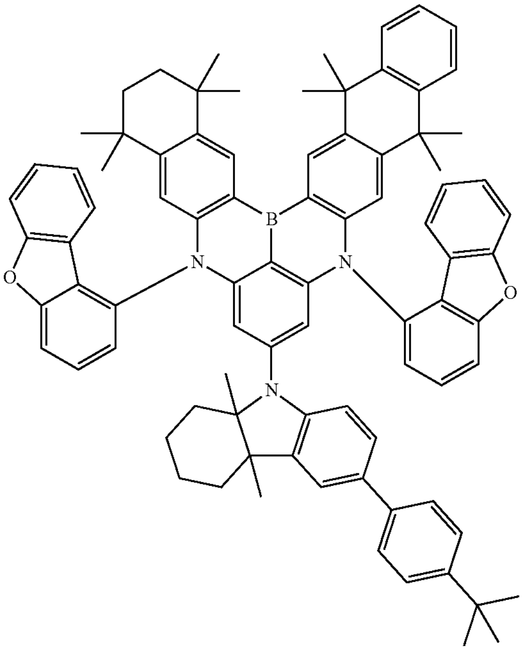
-continued
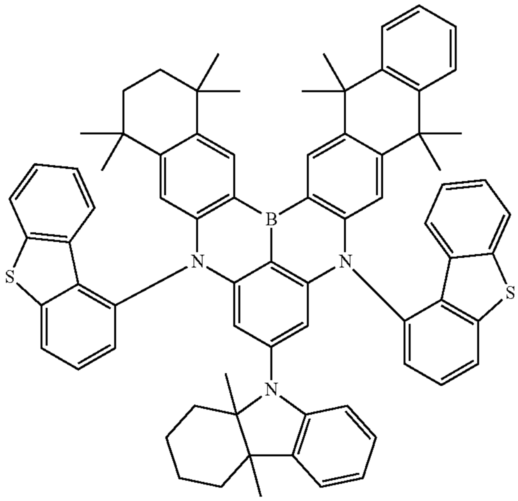
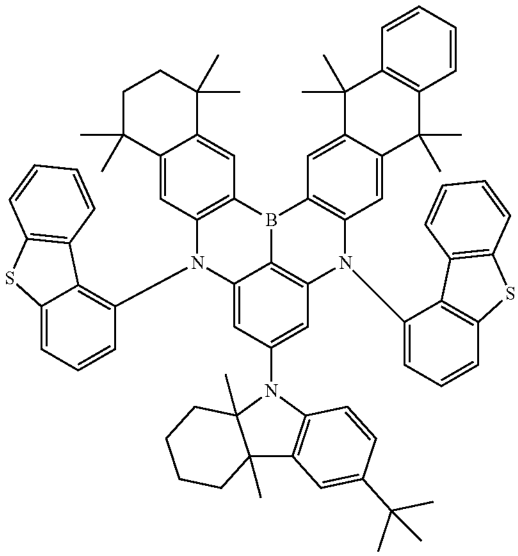
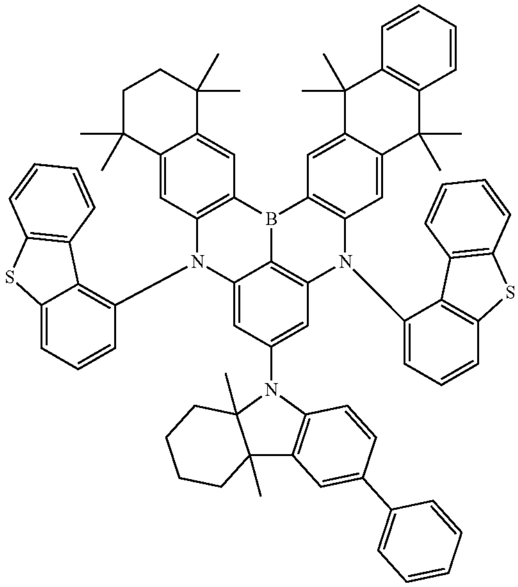

-continued
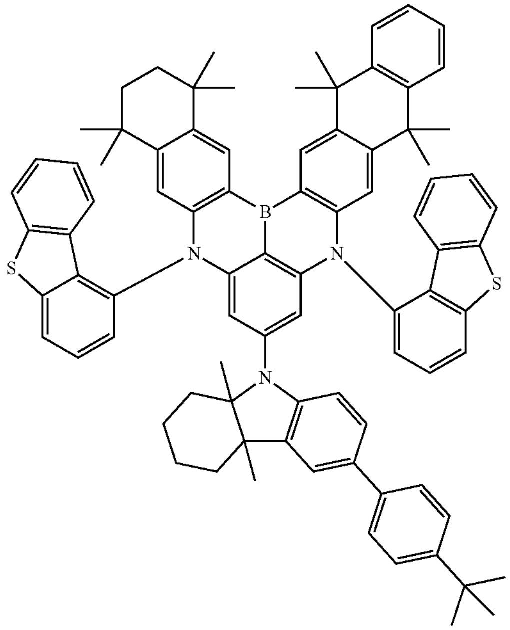
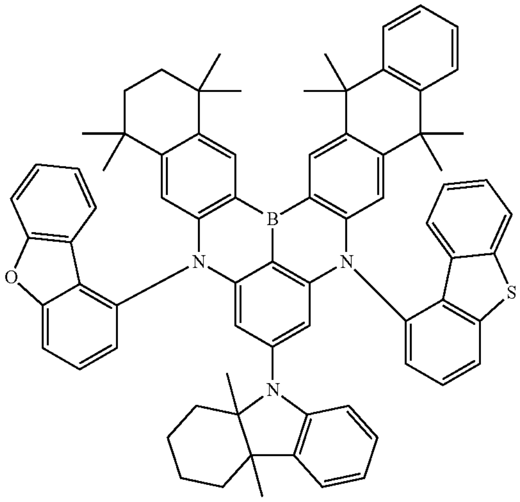
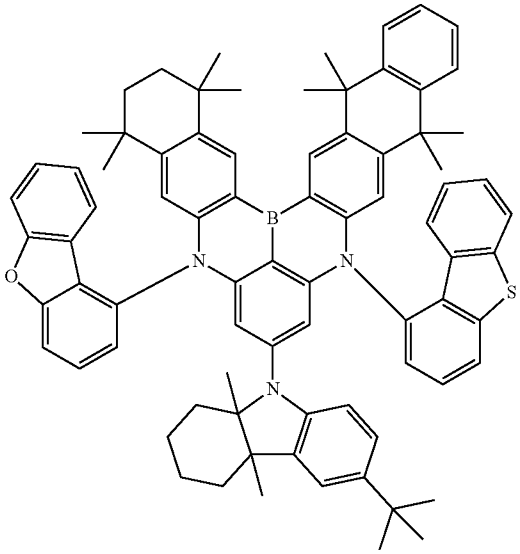
-continued
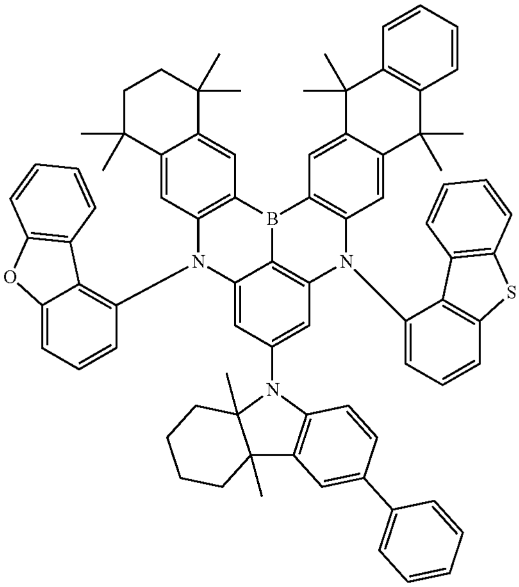
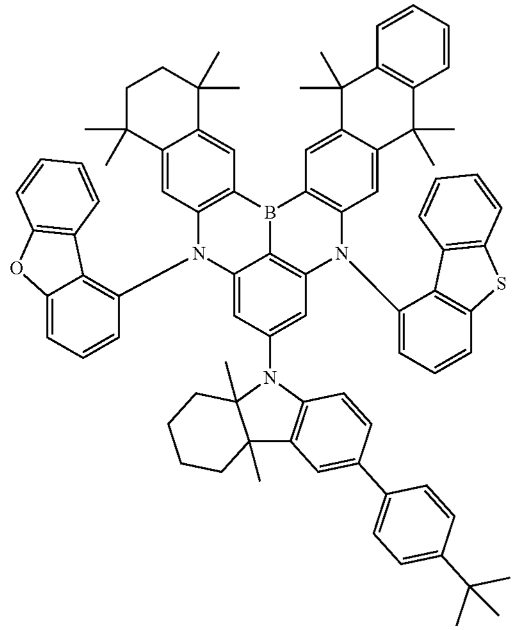
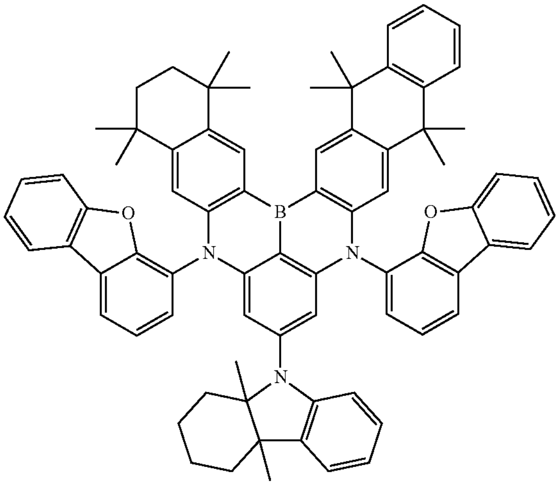

-continued
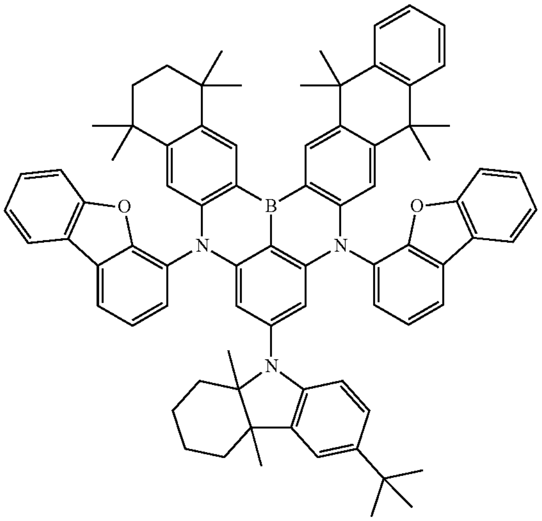
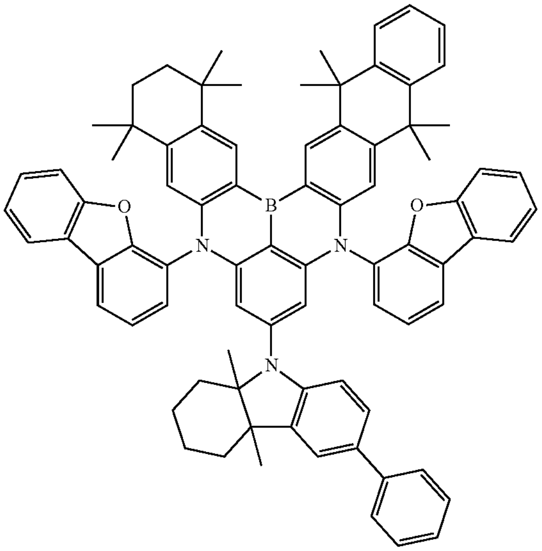
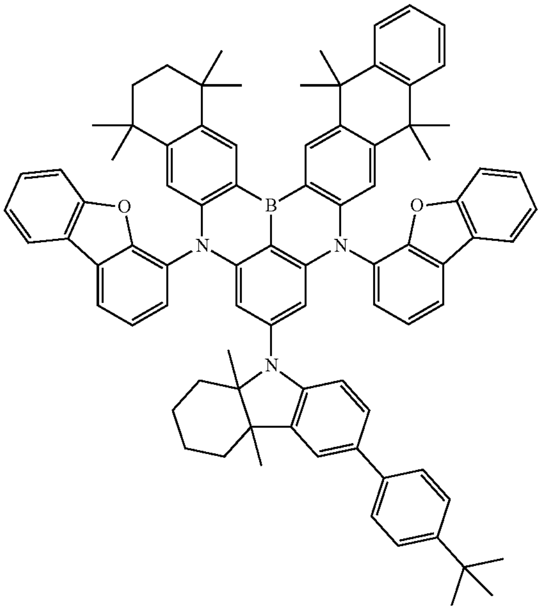
-continued
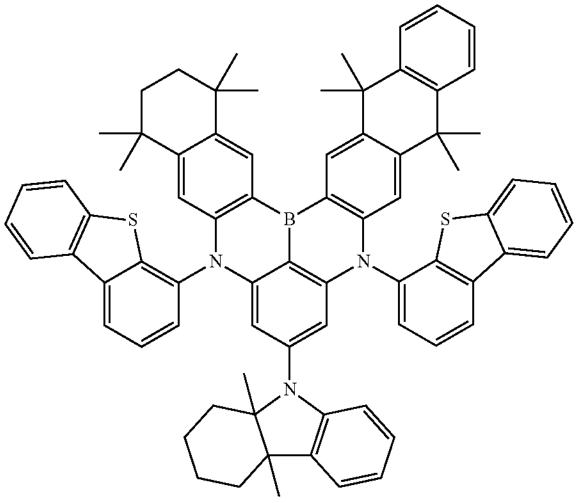
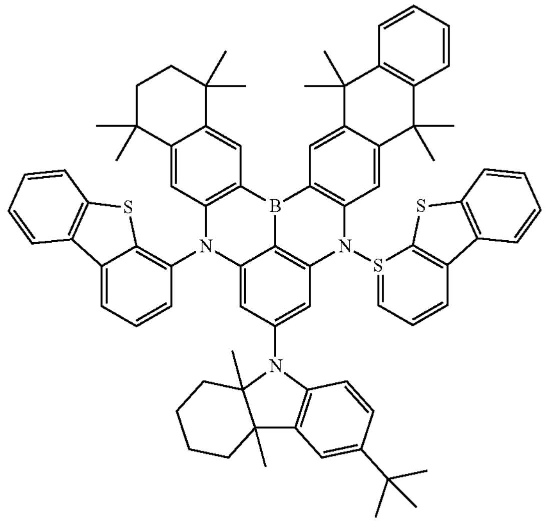
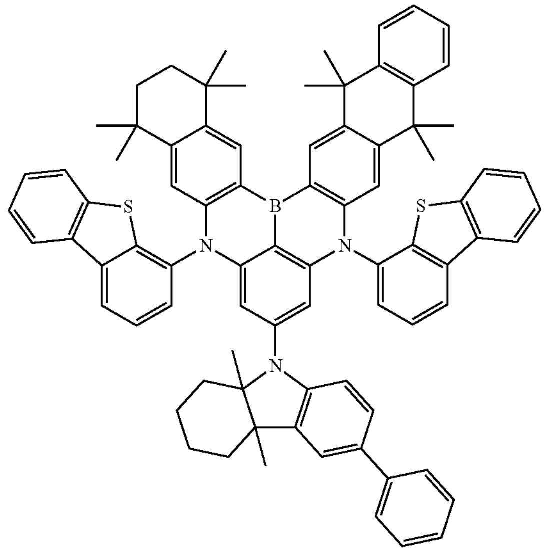

-continued
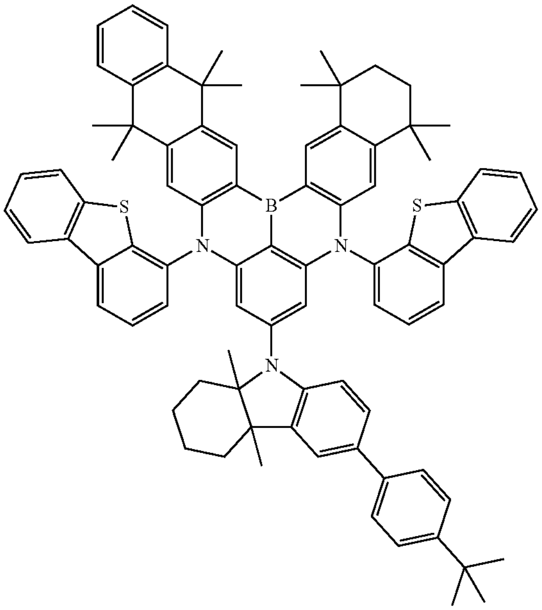
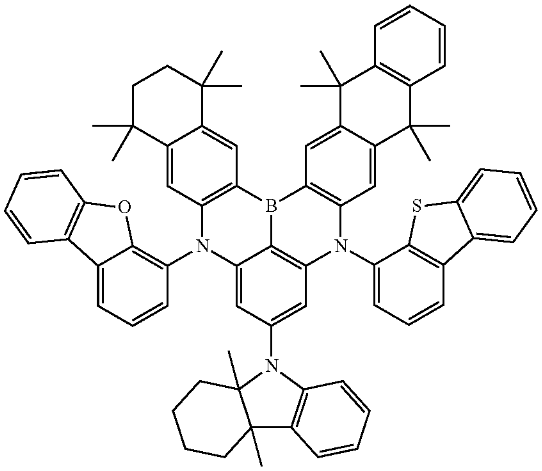
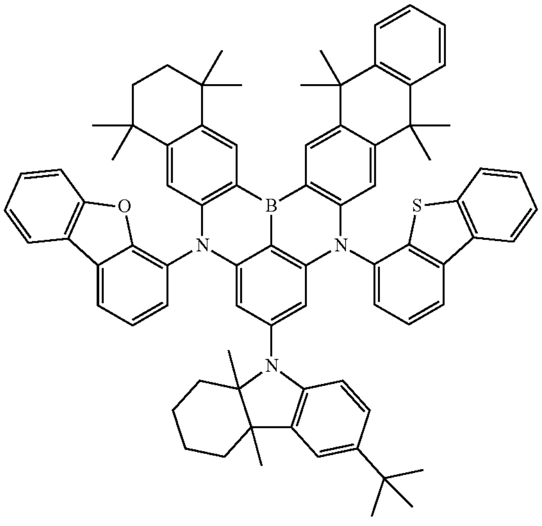
-continued
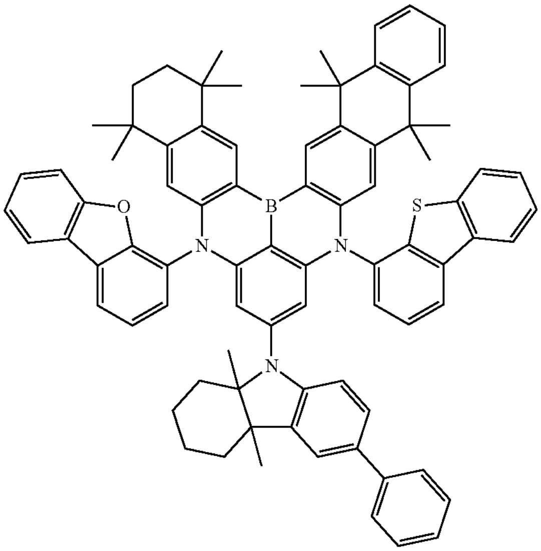
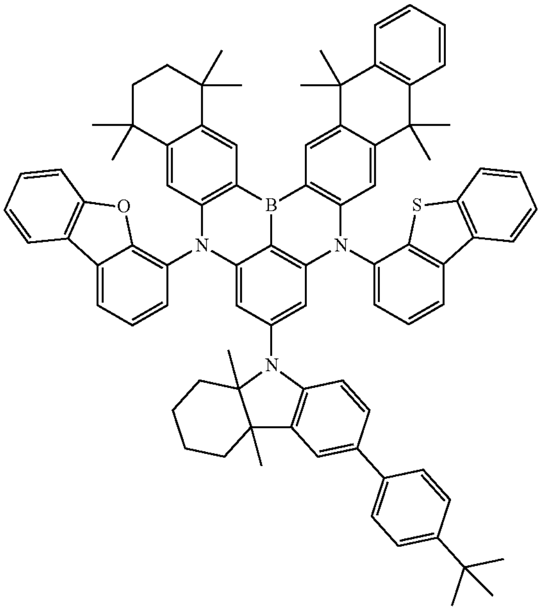
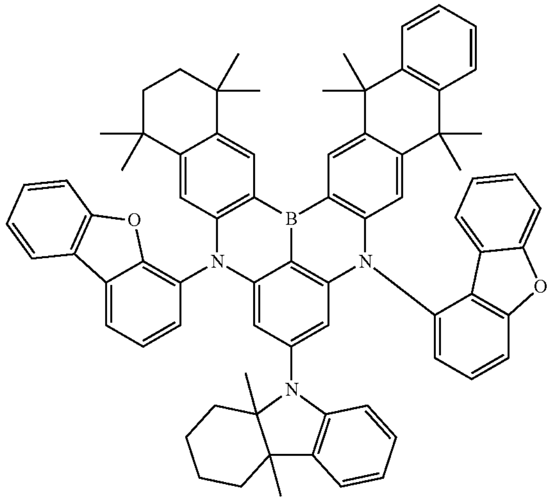

-continued
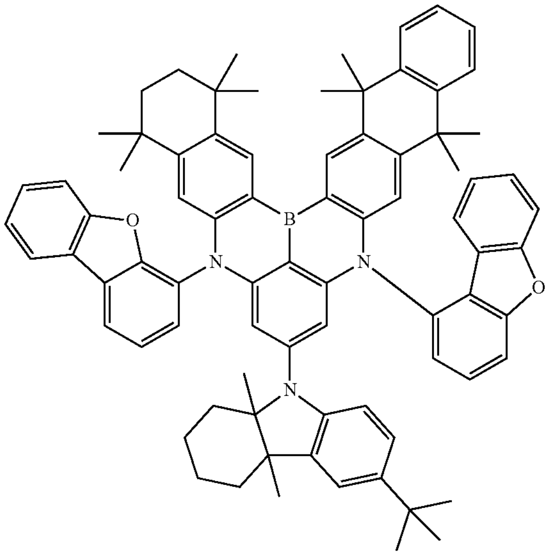
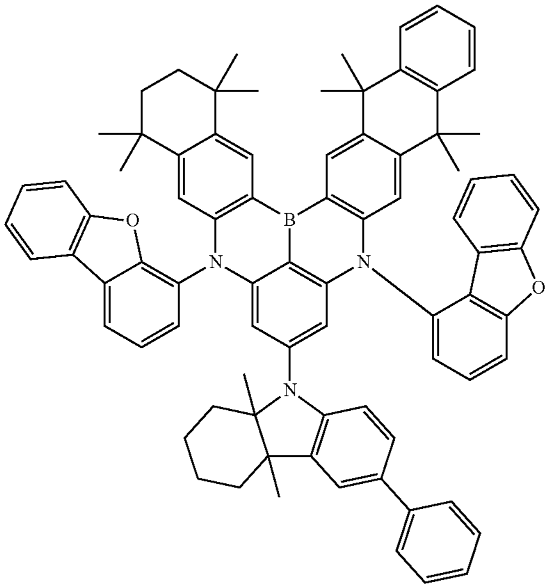
-continued
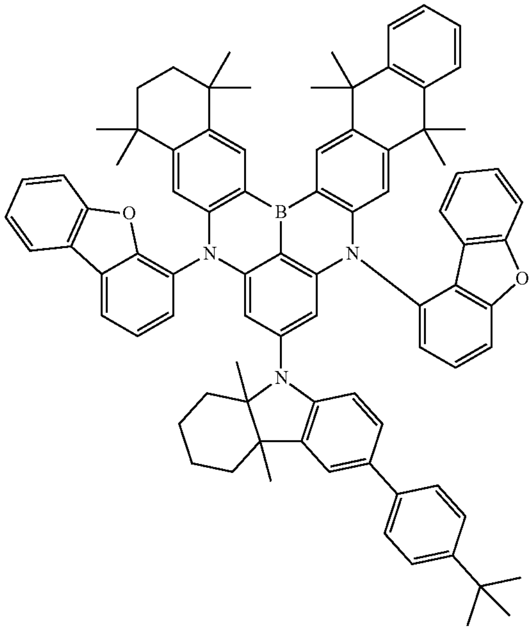
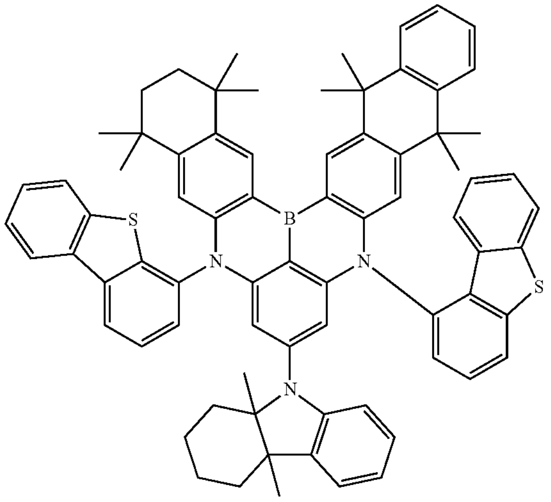
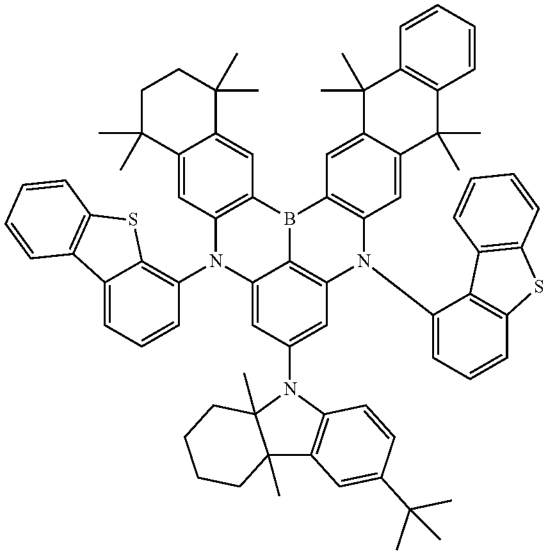

-continued
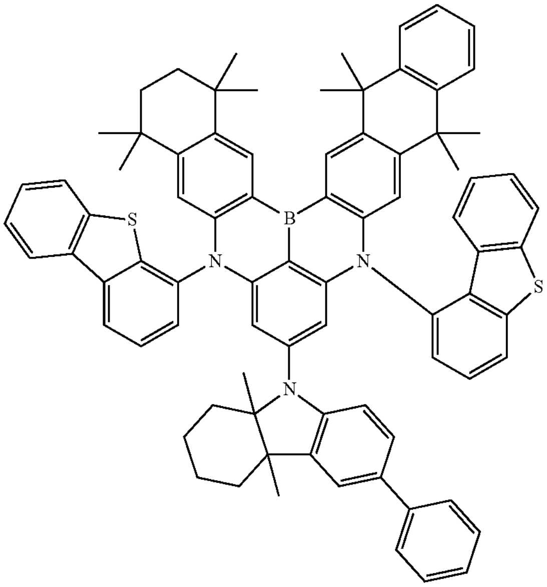
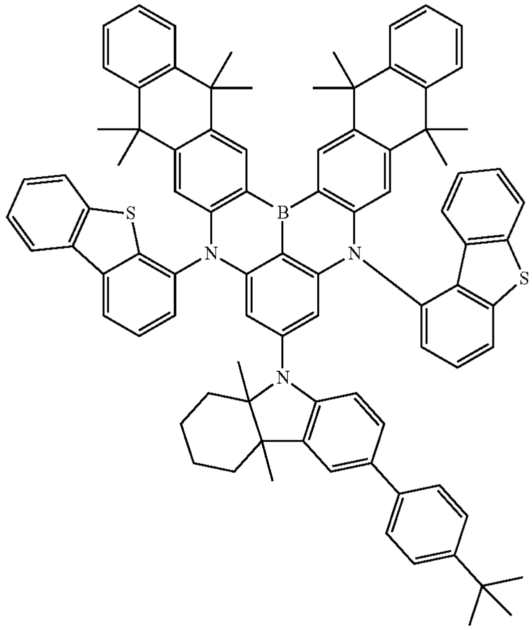
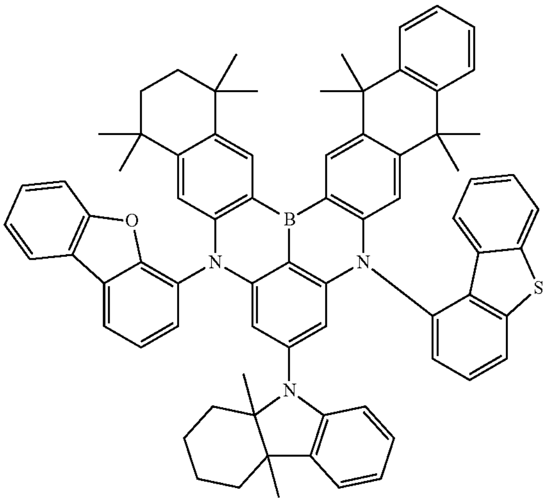
-continued
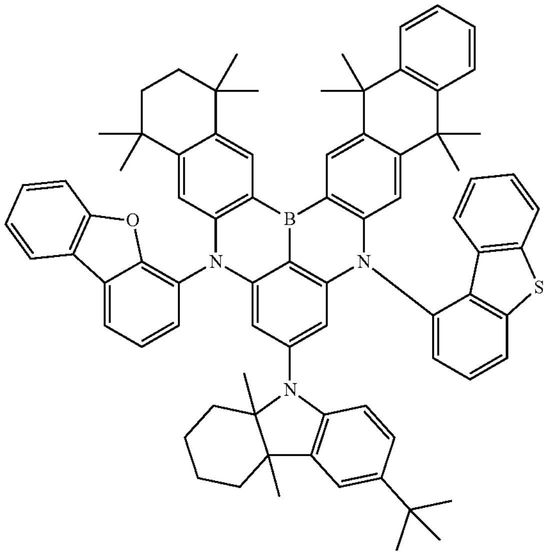
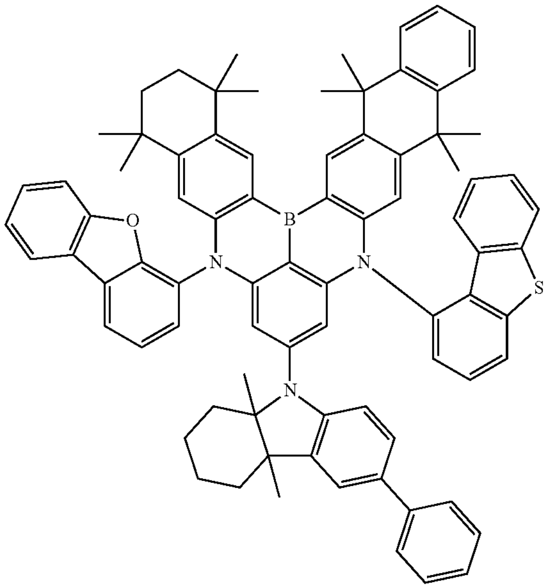

-continued
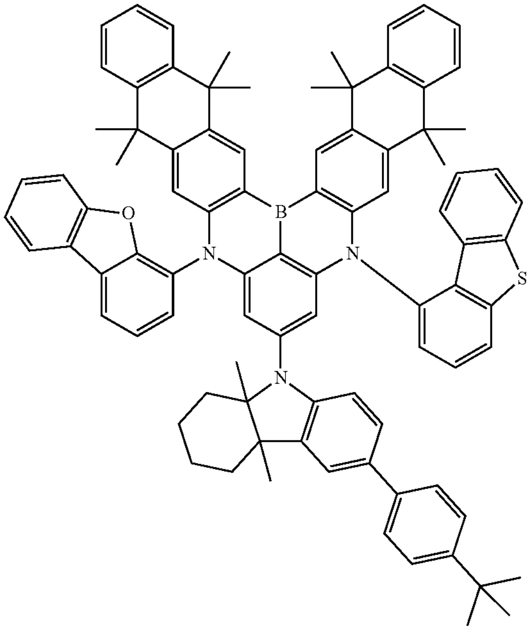
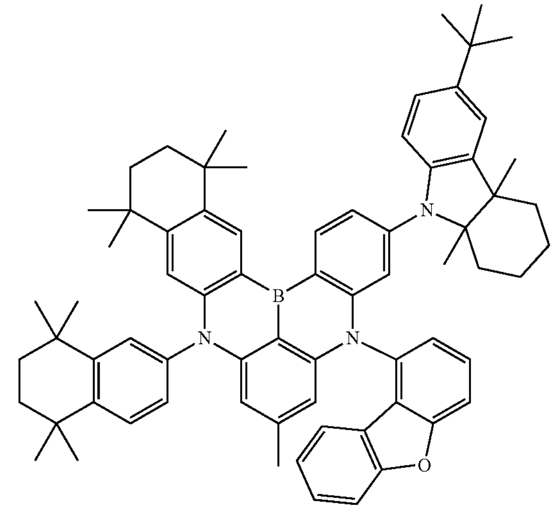
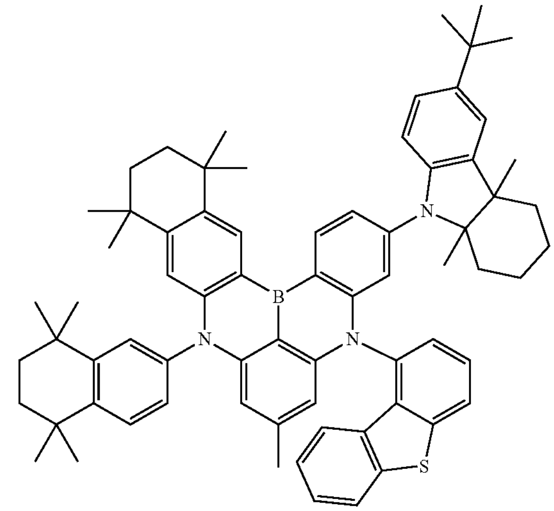
-continued
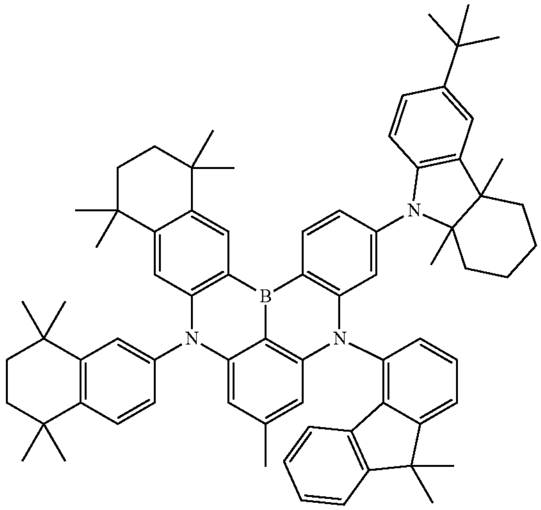
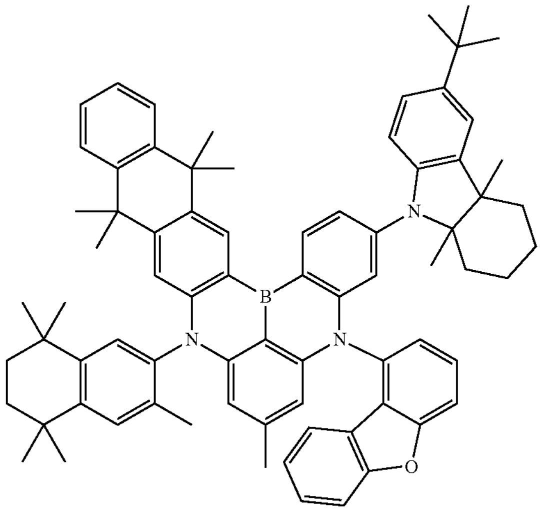
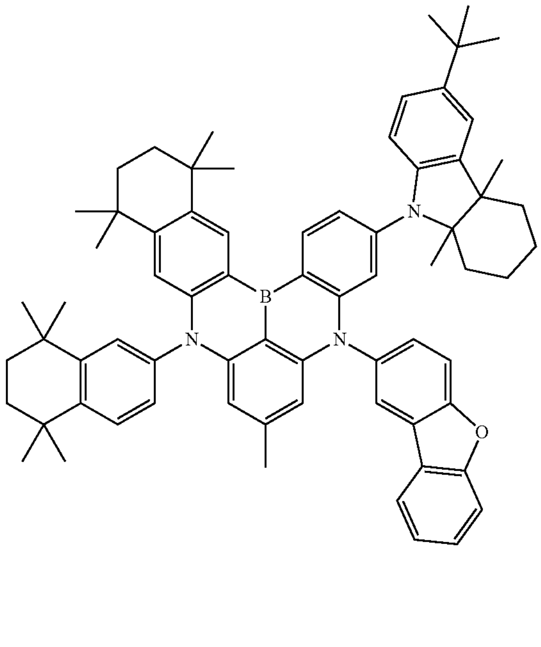

-continued
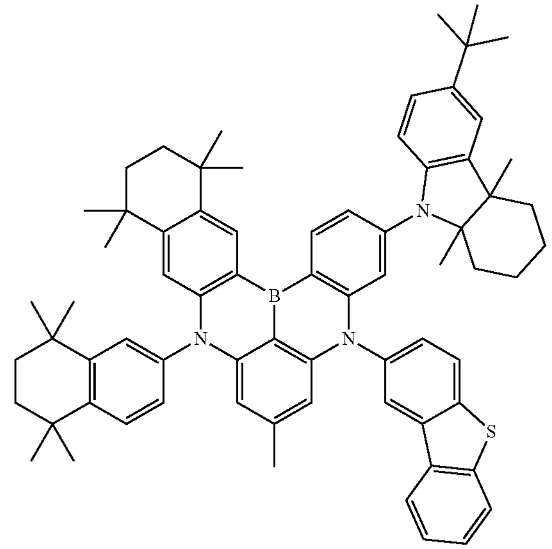
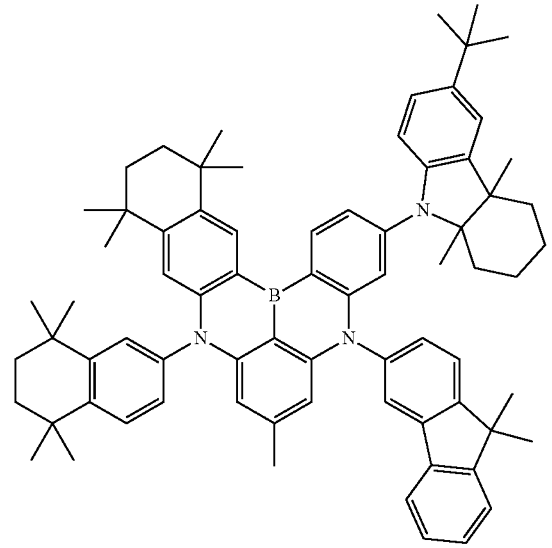
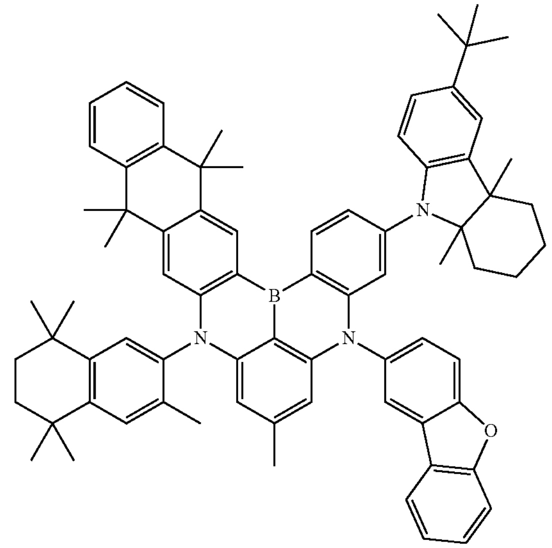
-continued
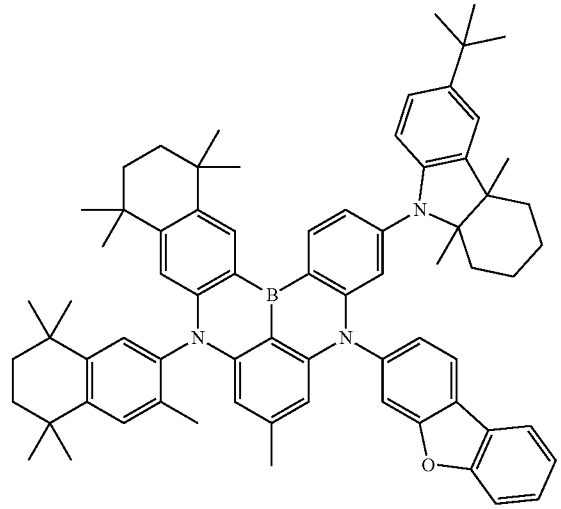
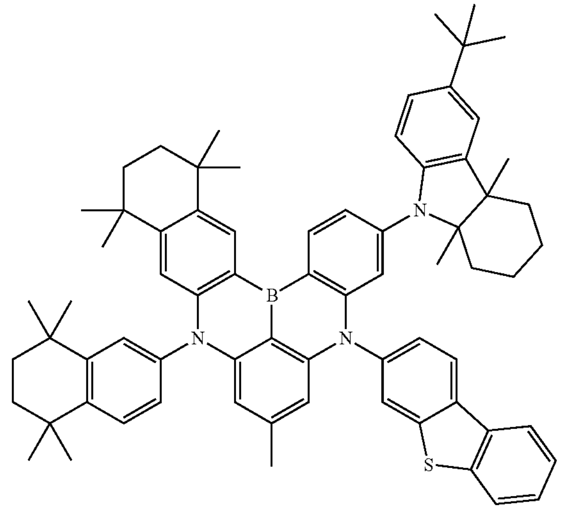
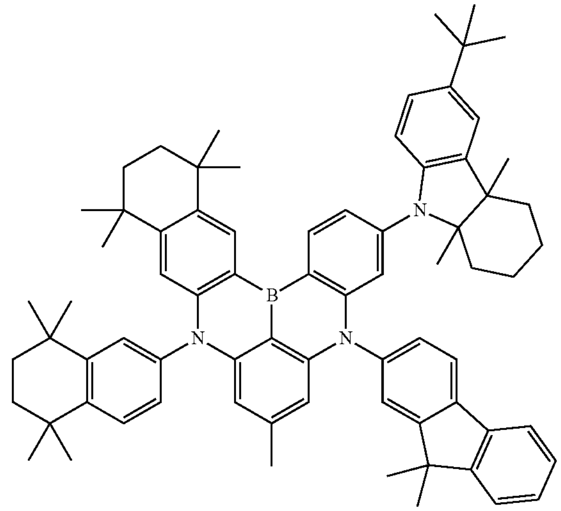

-continued
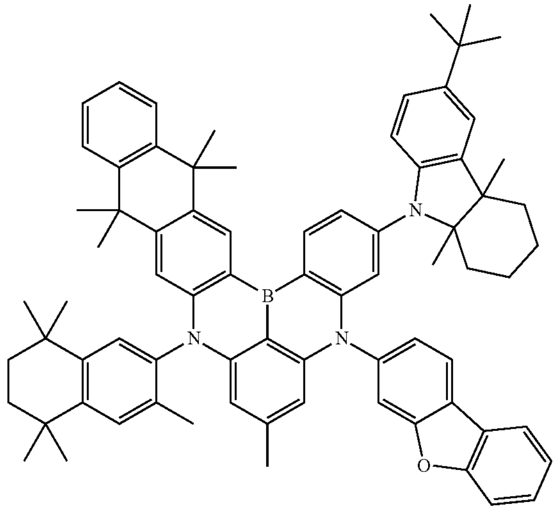
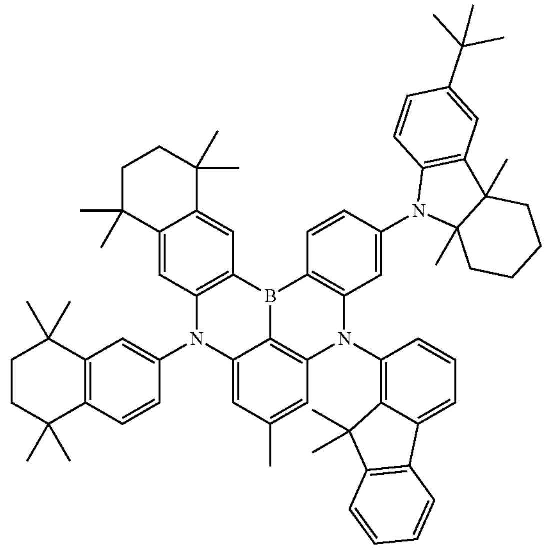
-continued
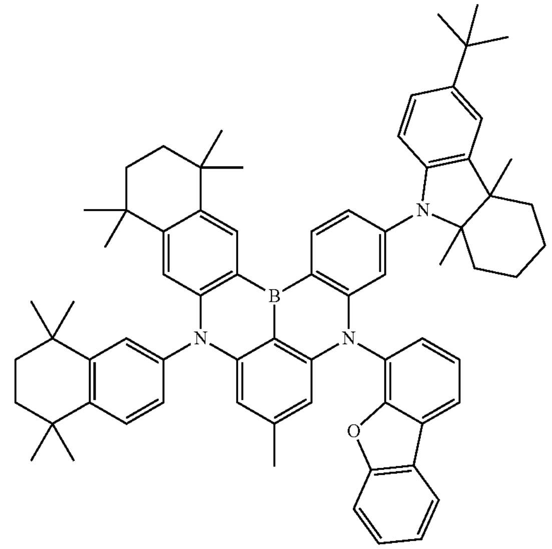
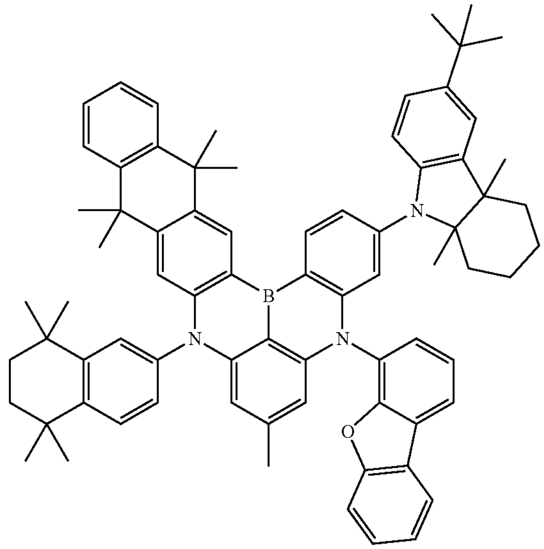
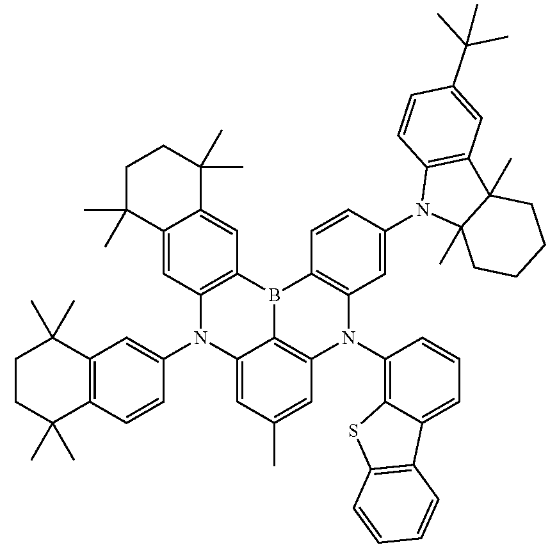
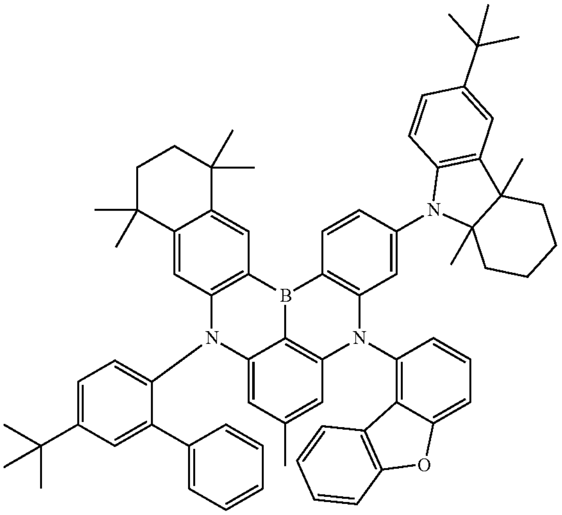

-continued
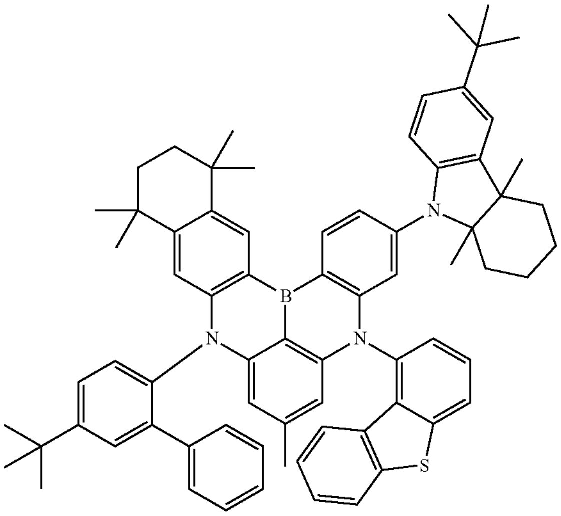
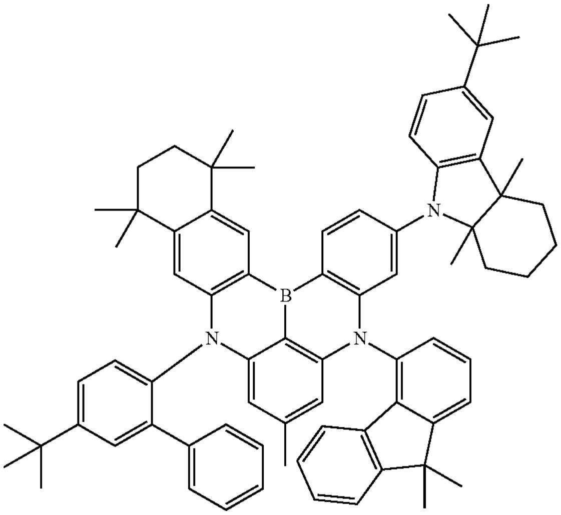
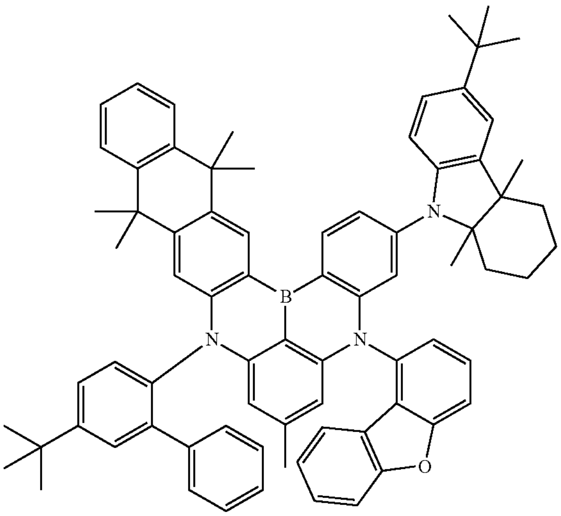
-continued
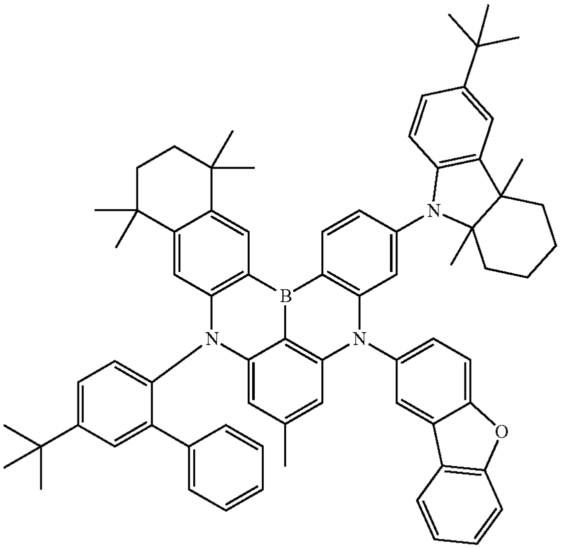
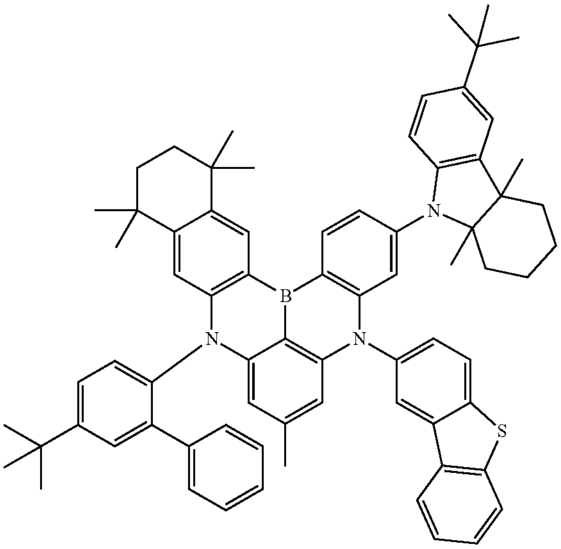
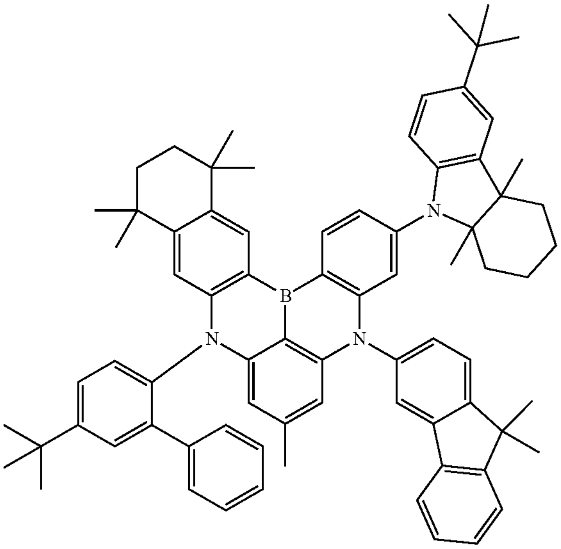

-continued
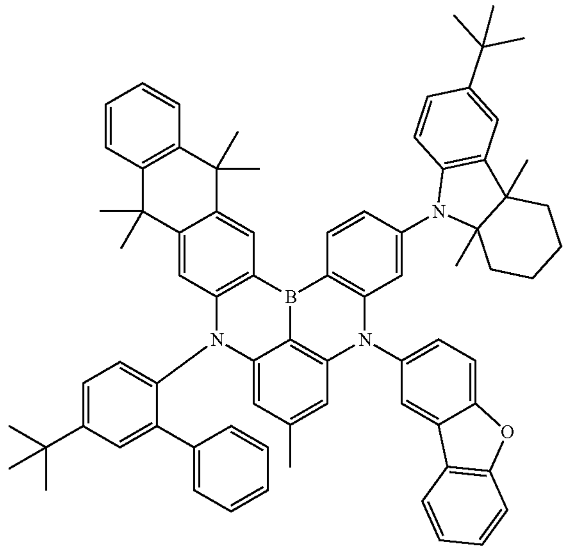
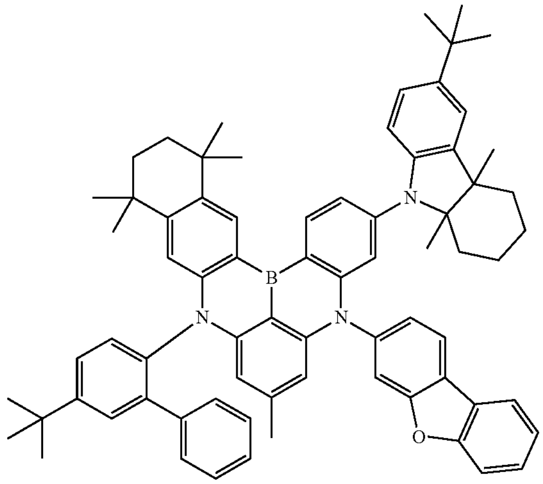
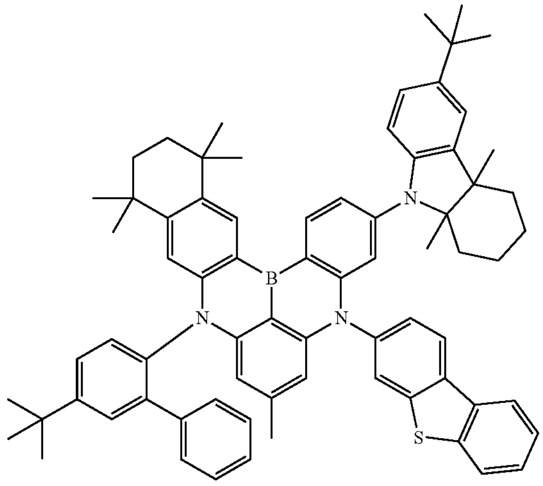
-continued
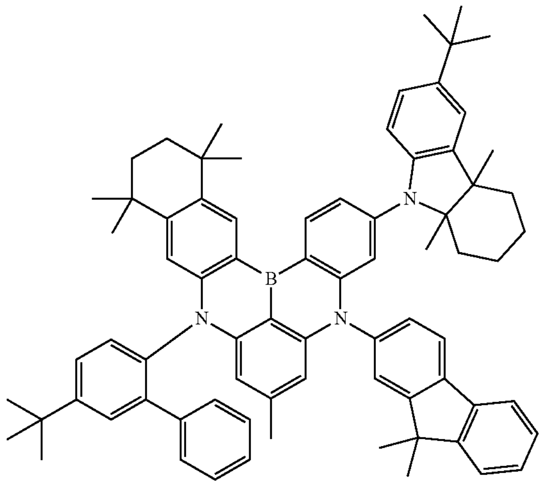
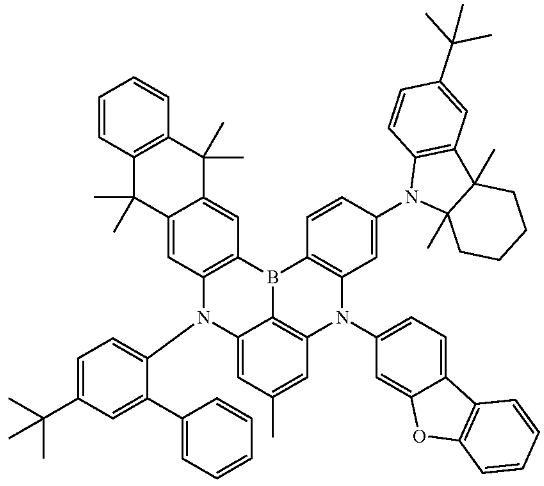
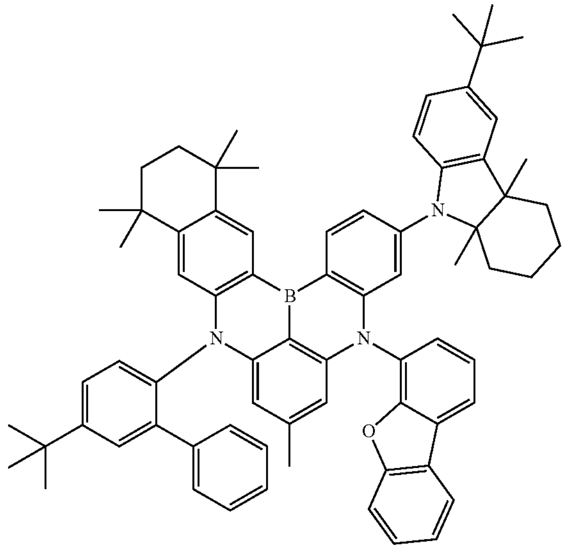

-continued
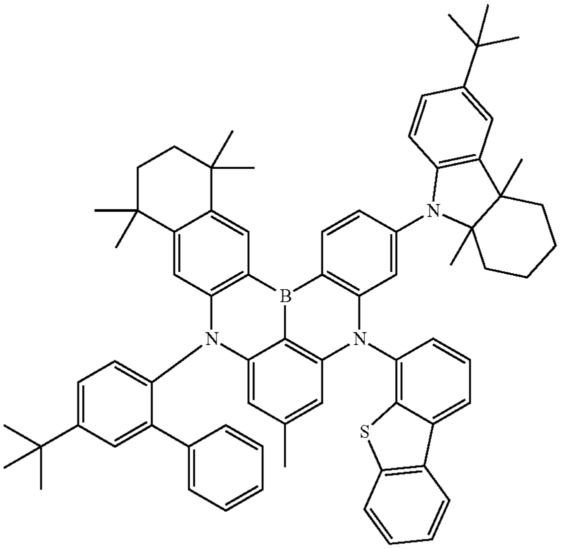
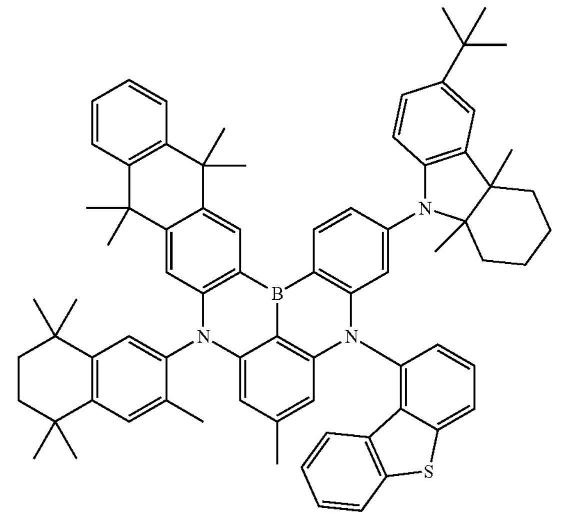
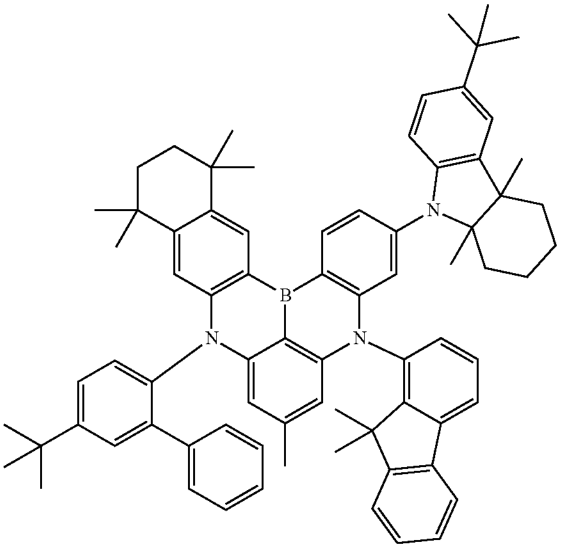
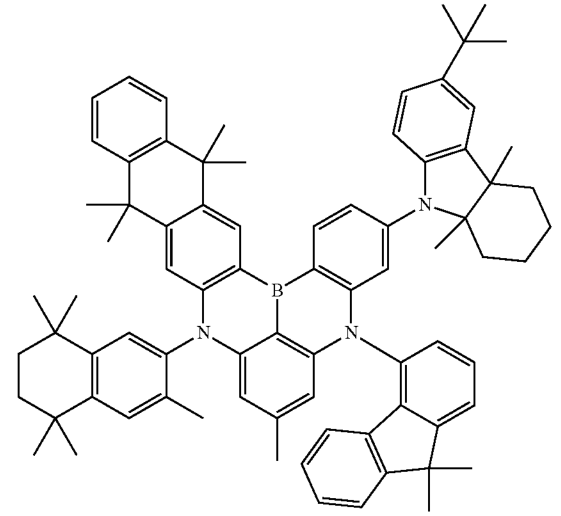
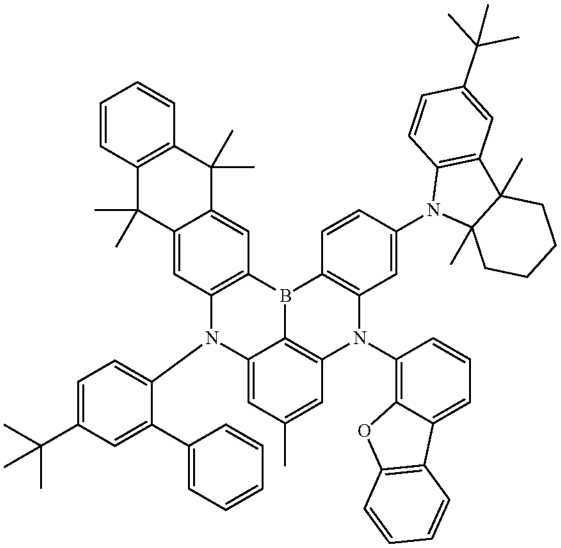
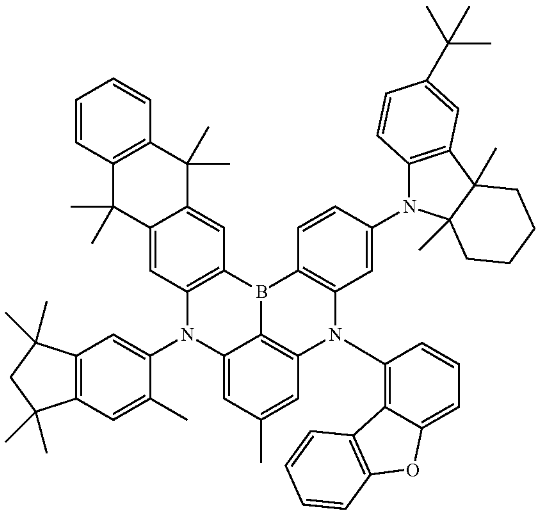

-continued
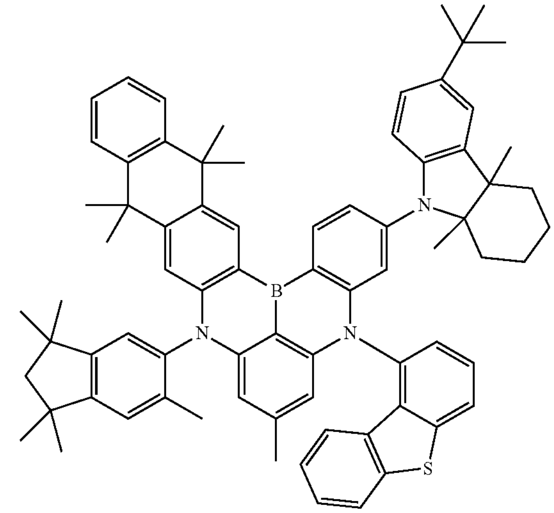
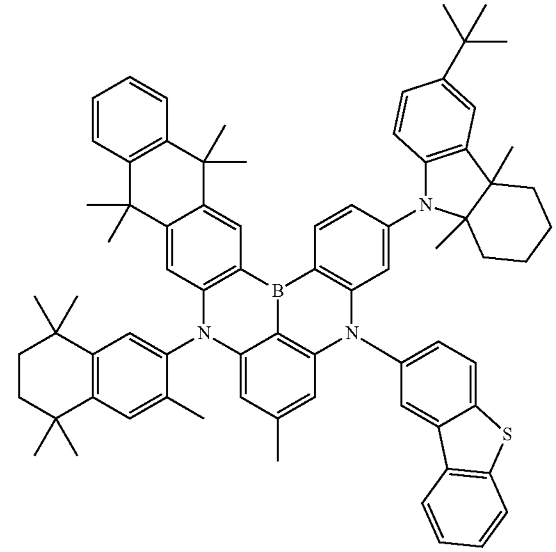
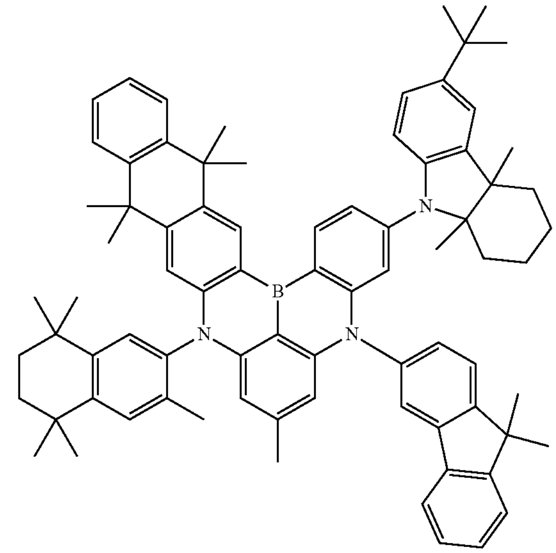
-continued
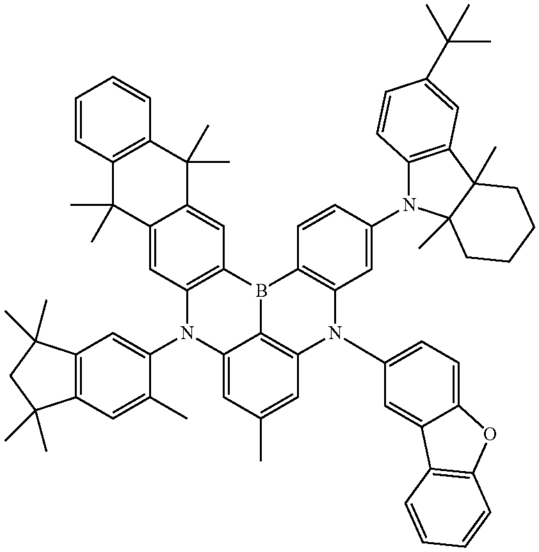
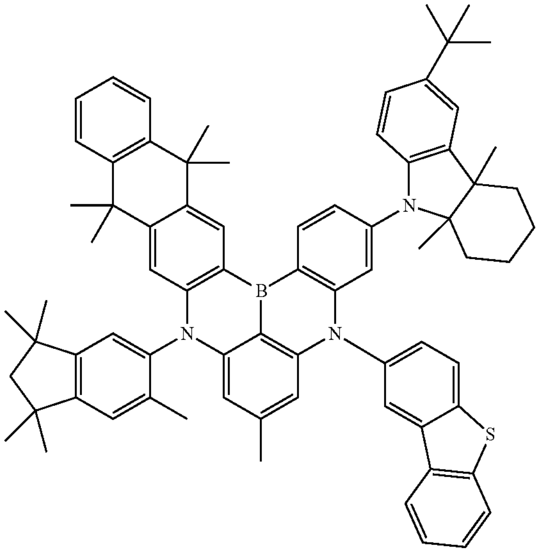
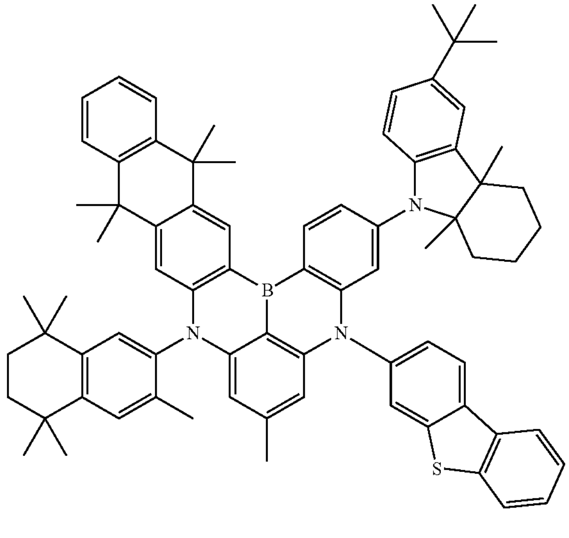

-continued
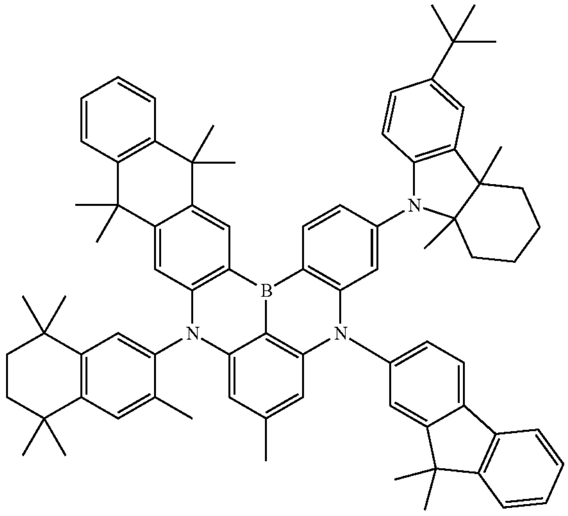
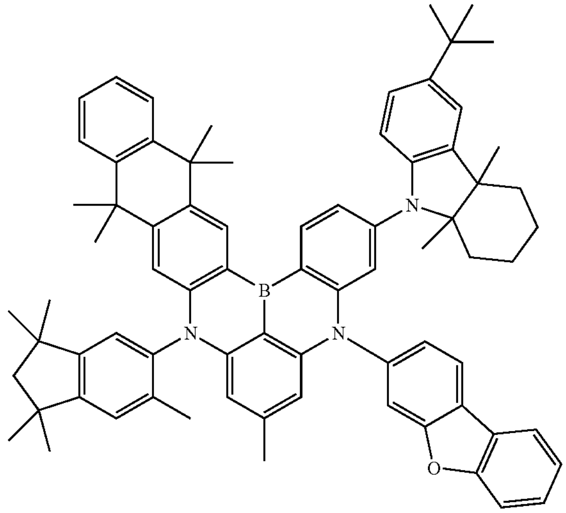
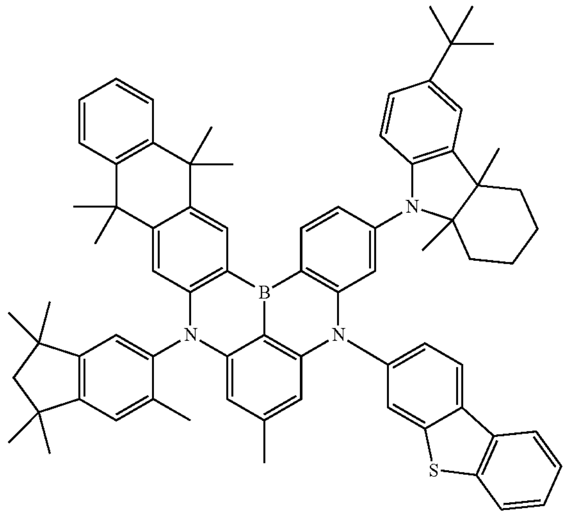
-continued
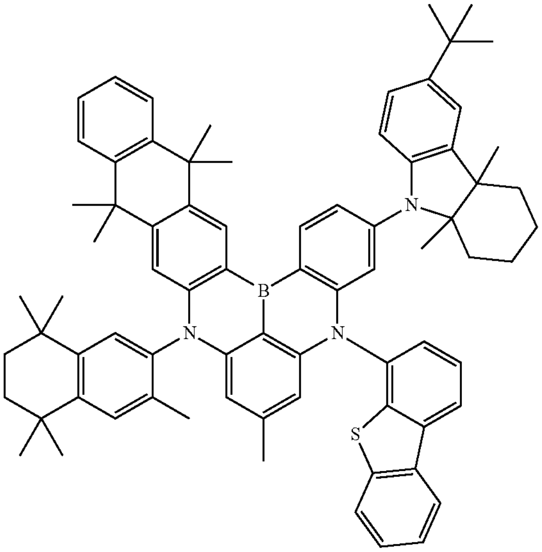
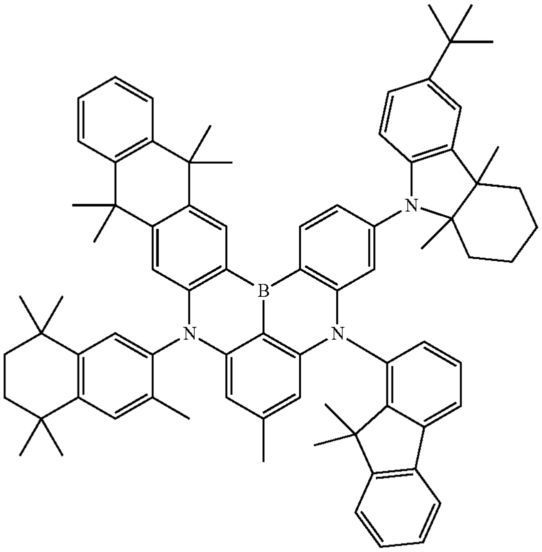
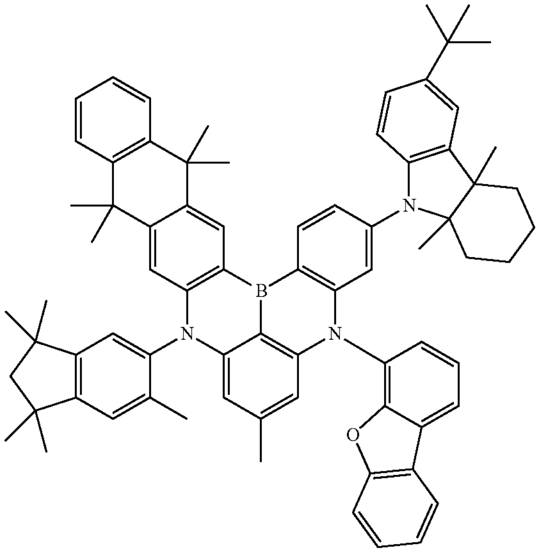

-continued
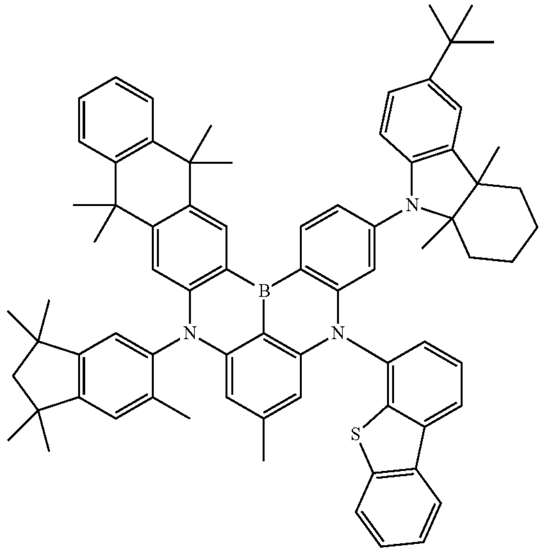
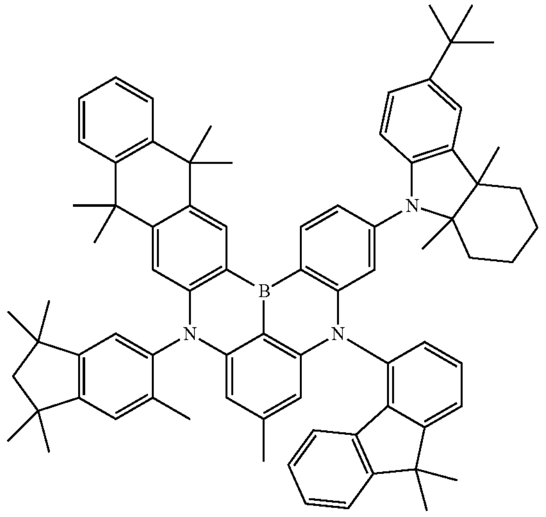
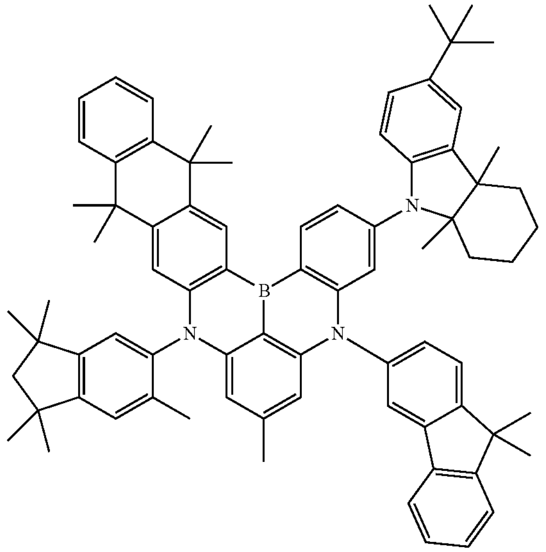
-continued
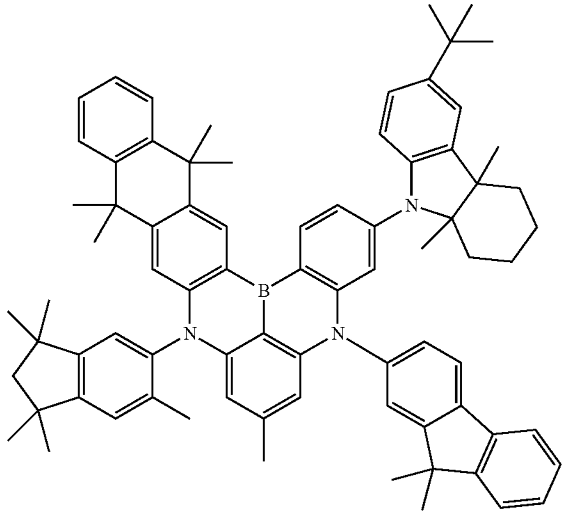
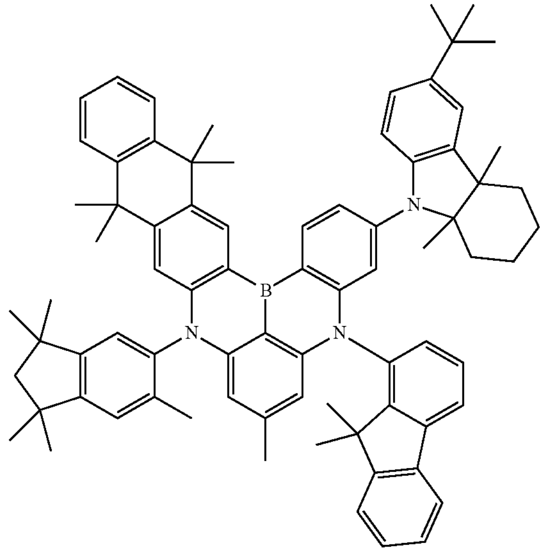
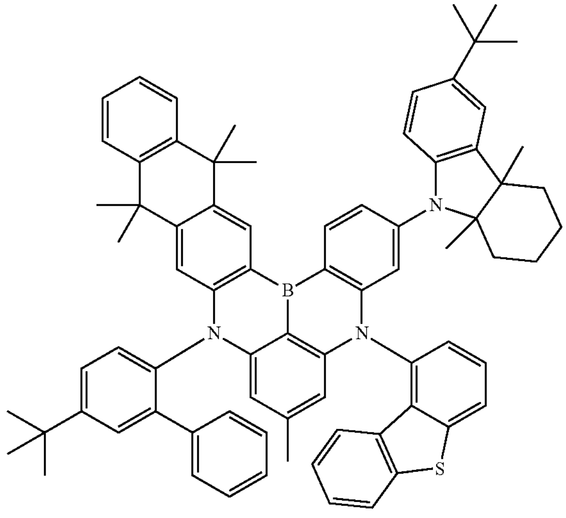

-continued
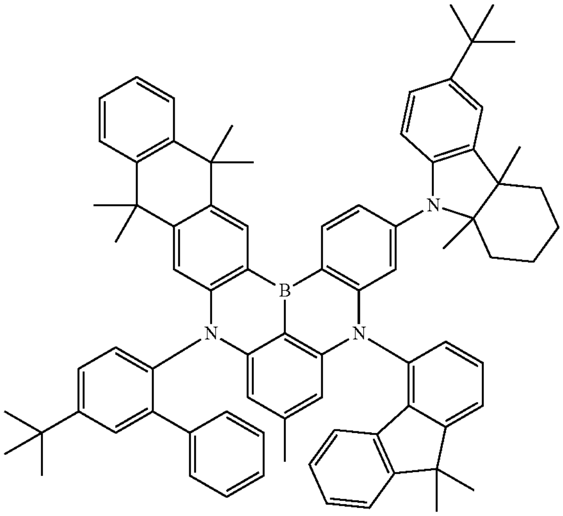
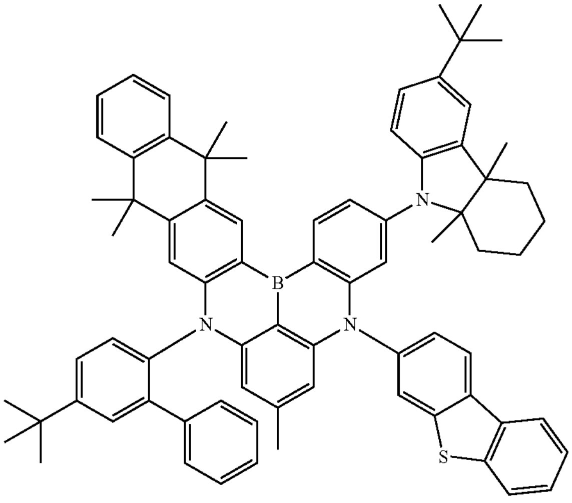
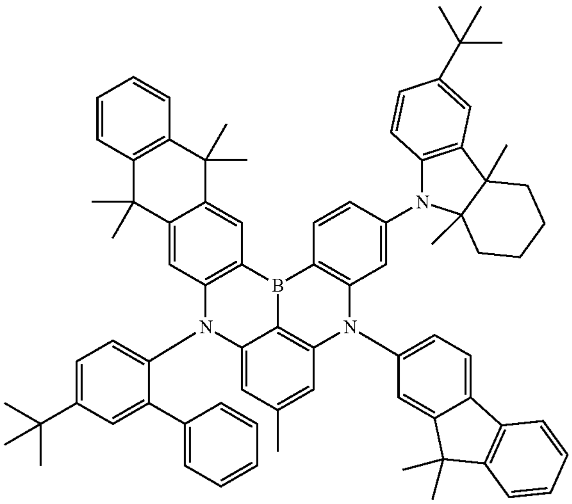
-continued
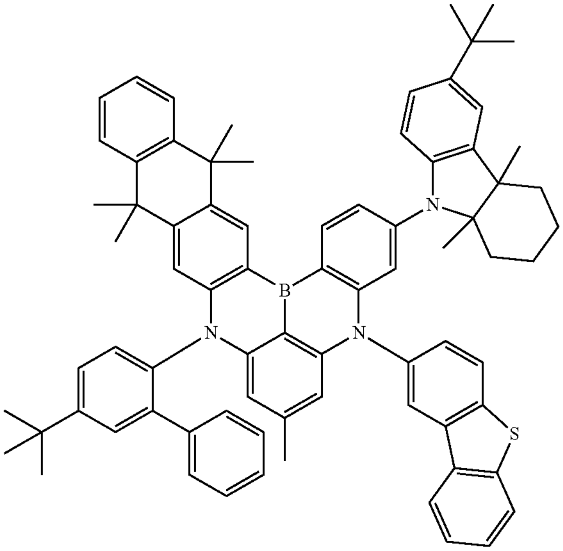
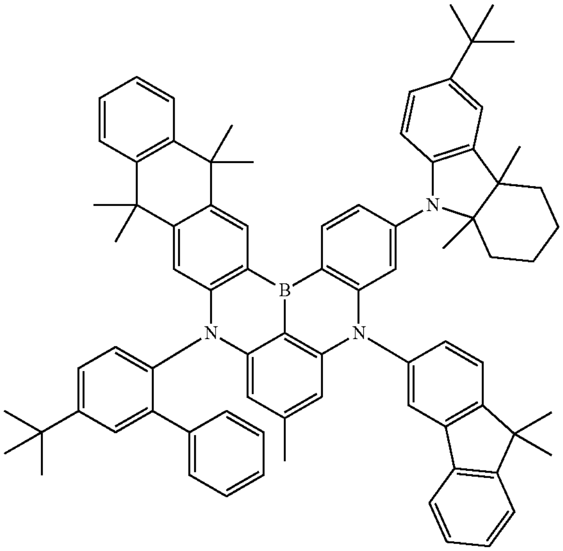
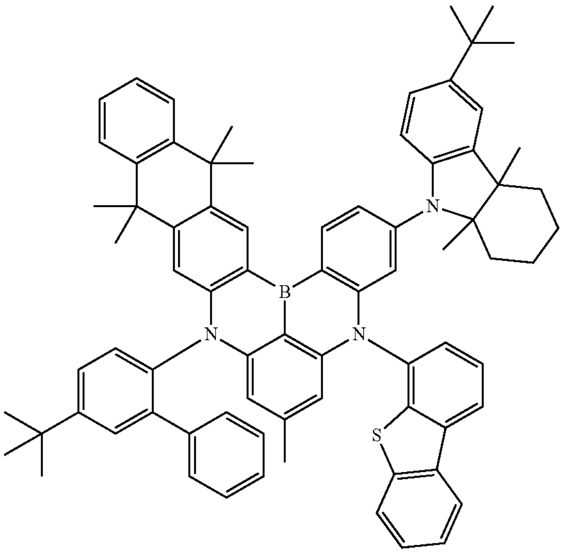

-continued
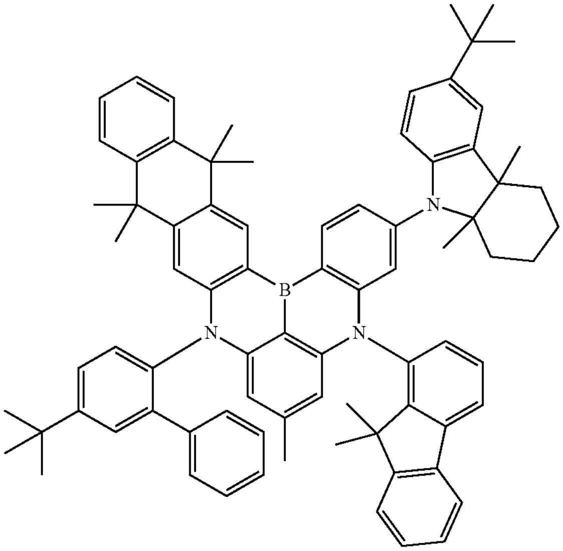
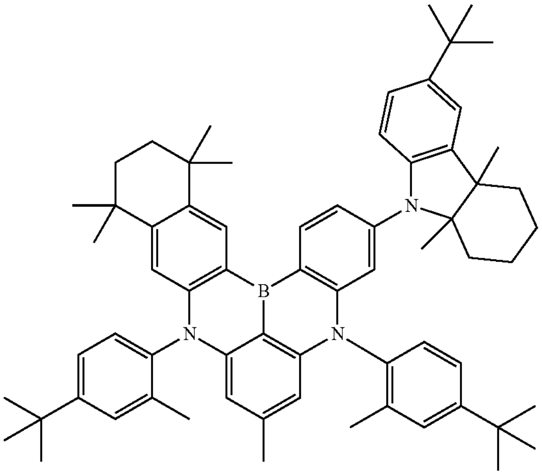
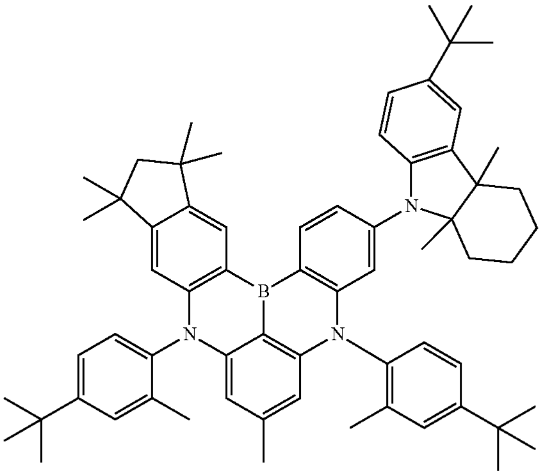
-continued
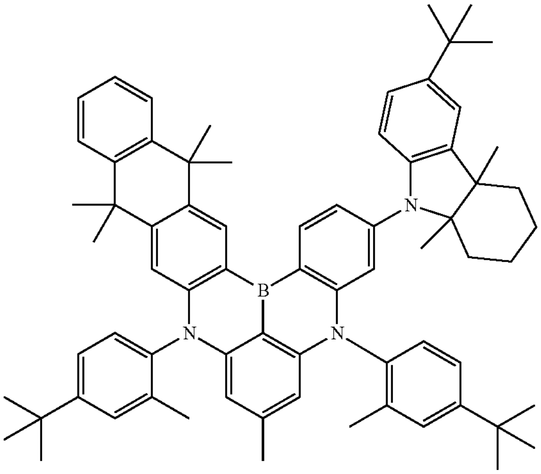
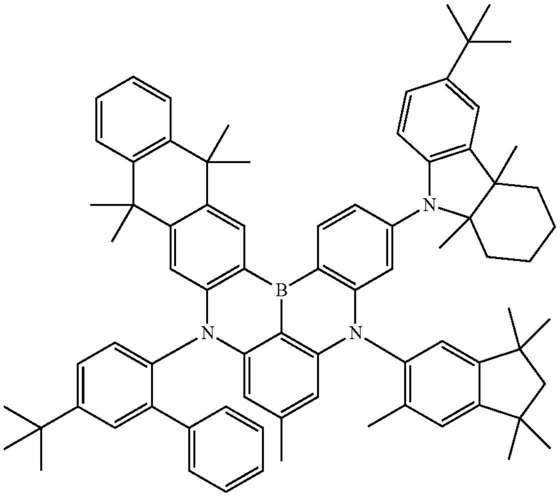
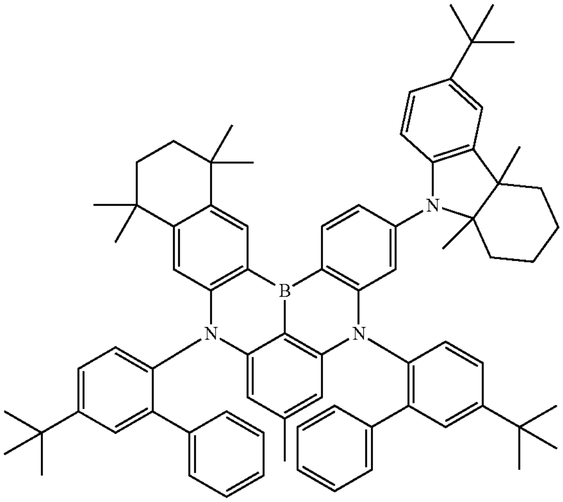

-continued
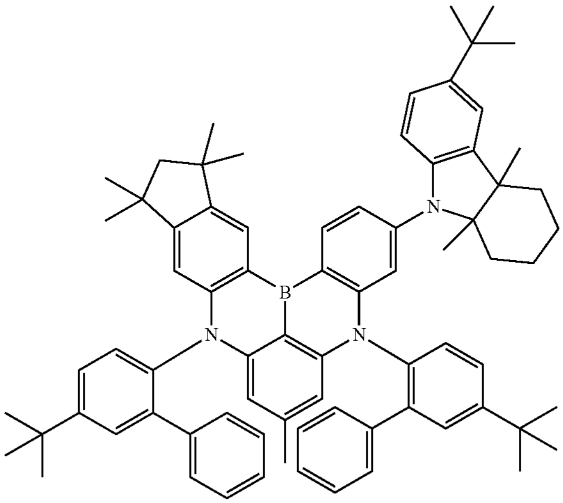
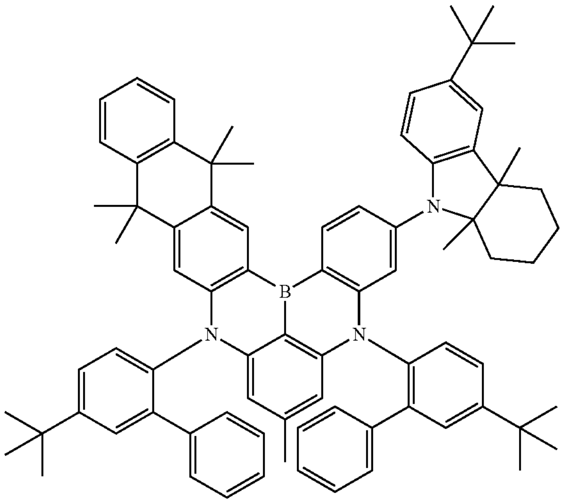
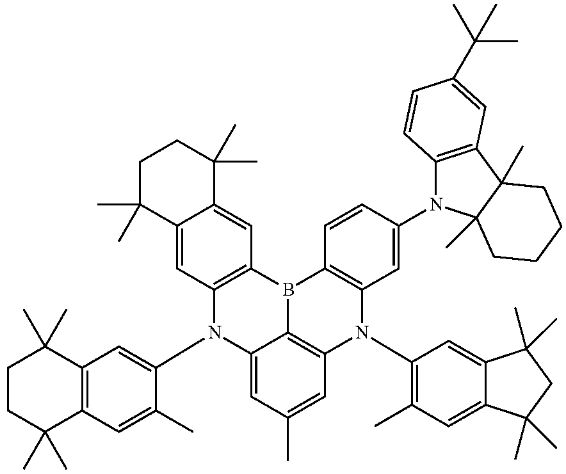
-continued
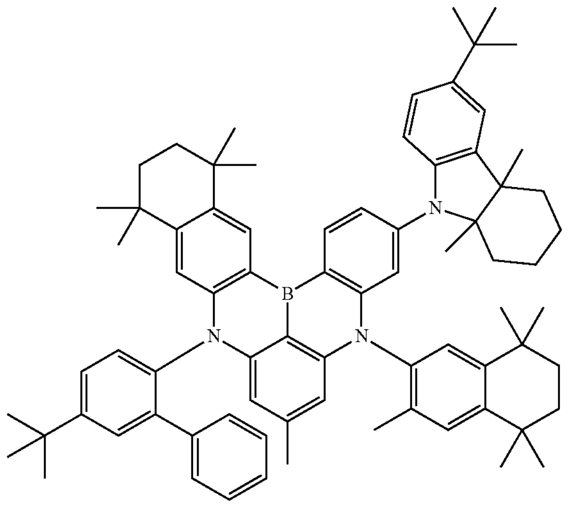
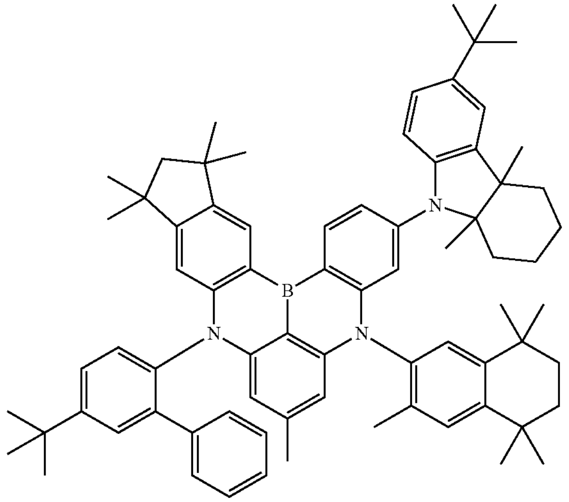
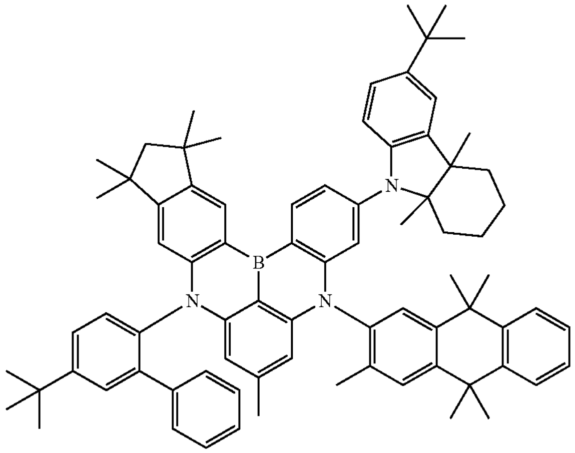

-continued
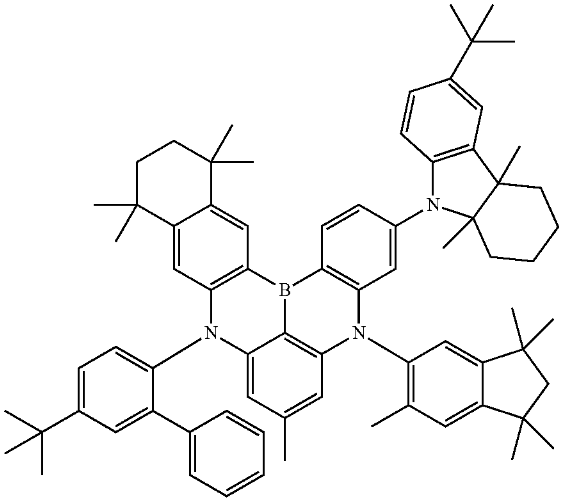
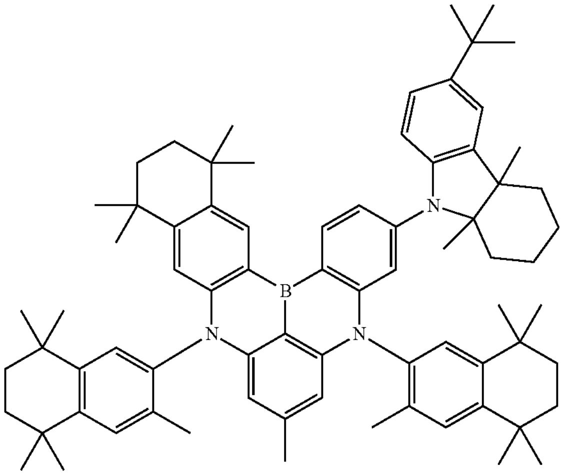
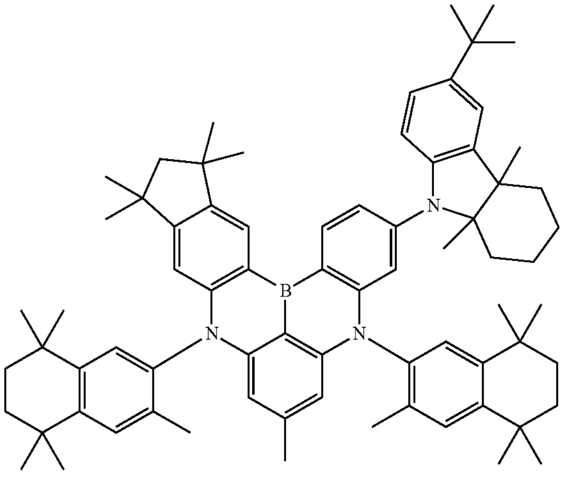
-continued
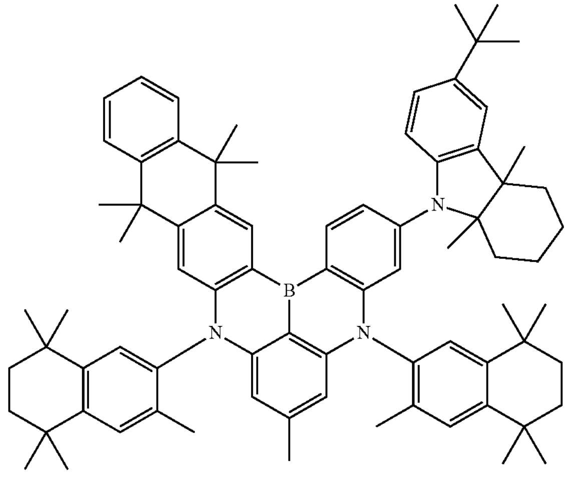
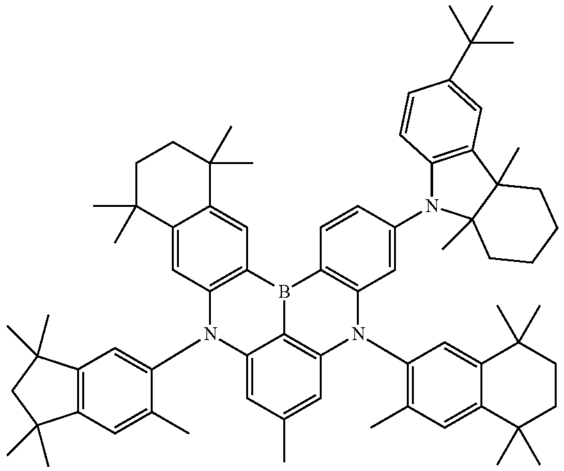
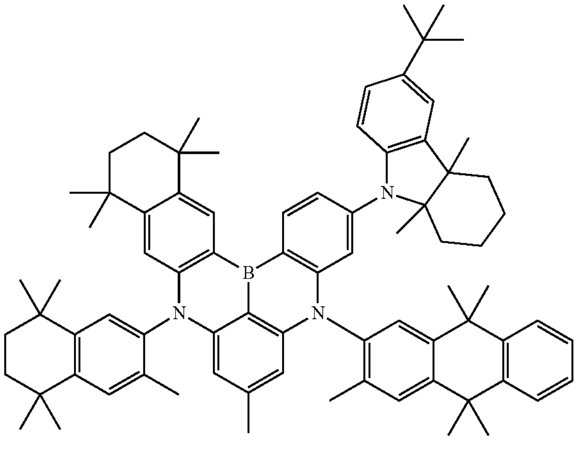

-continued
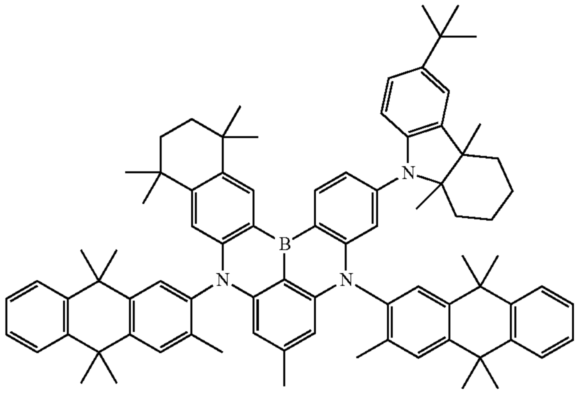
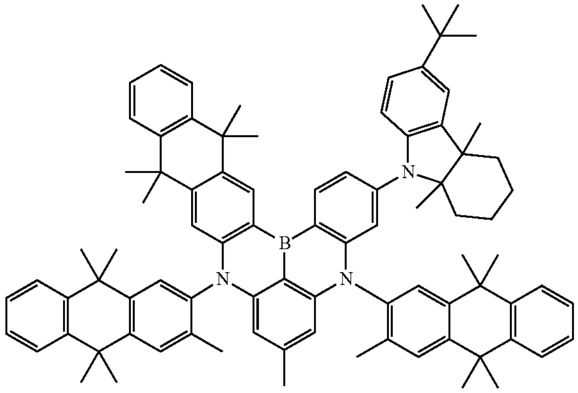
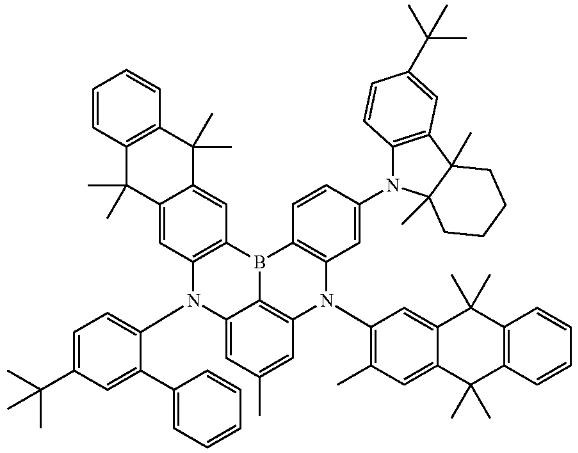
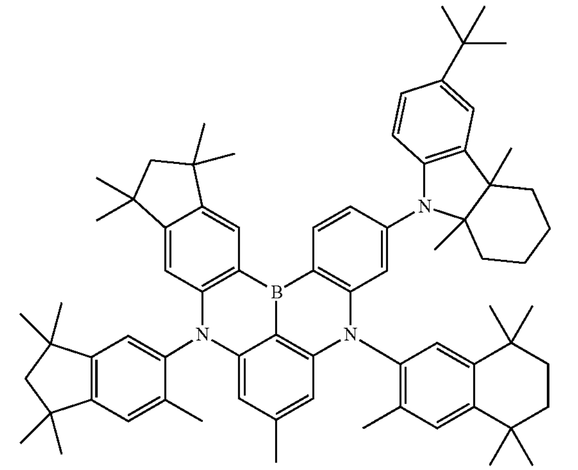
-continued
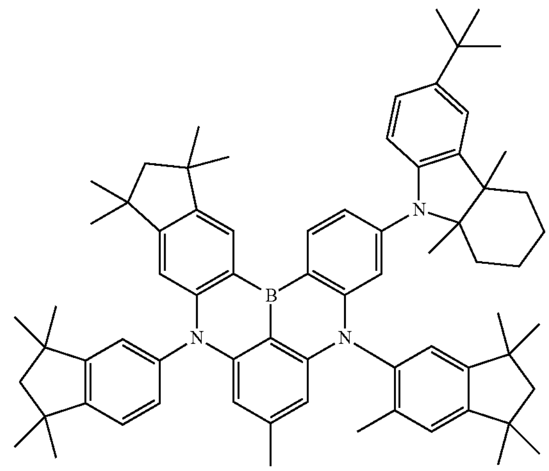
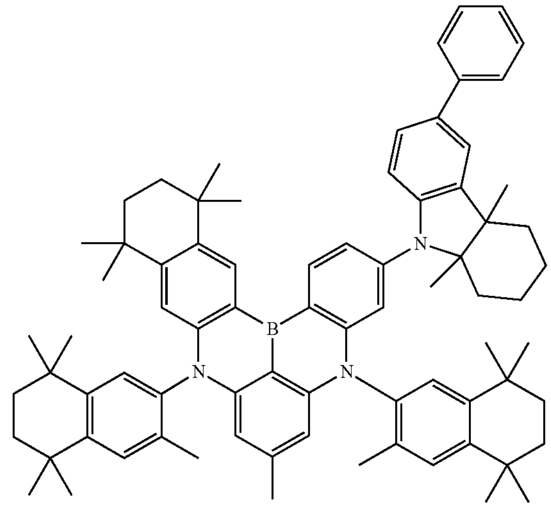
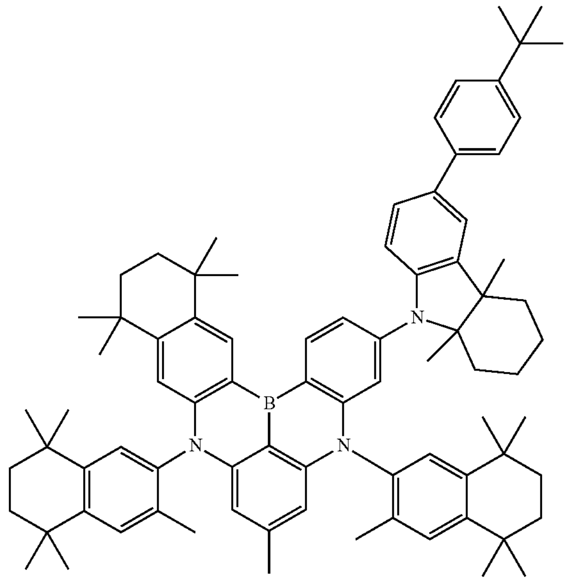

-continued
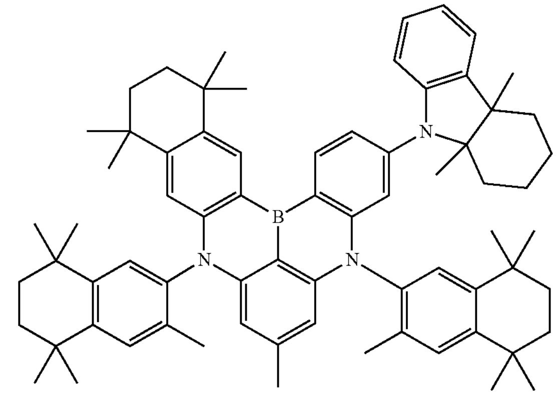
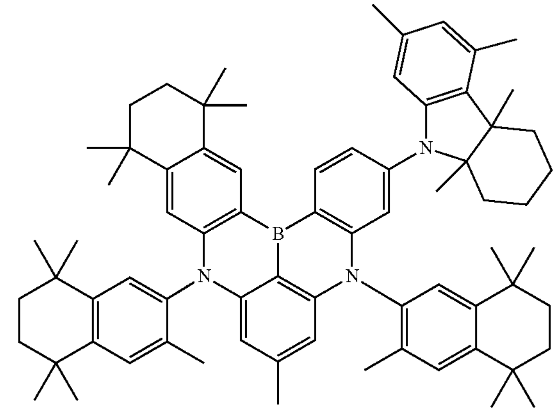
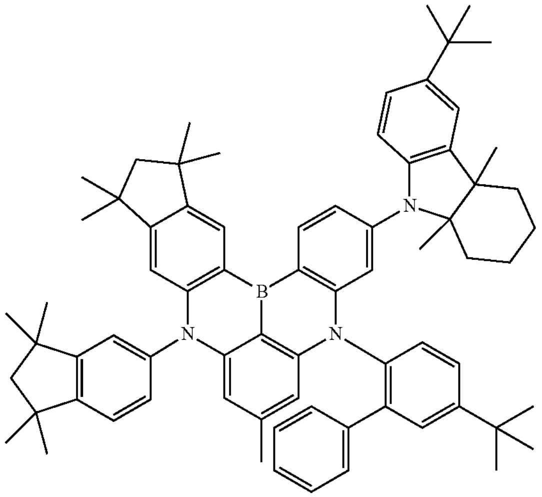
-continued
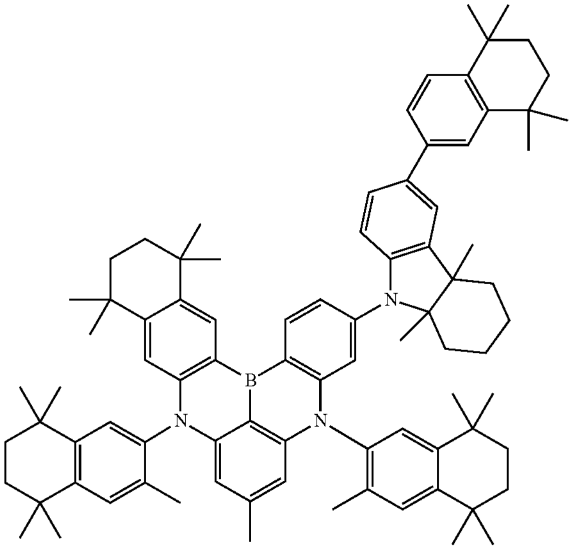
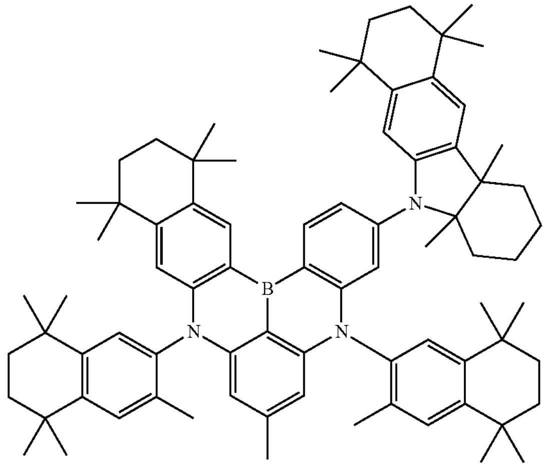
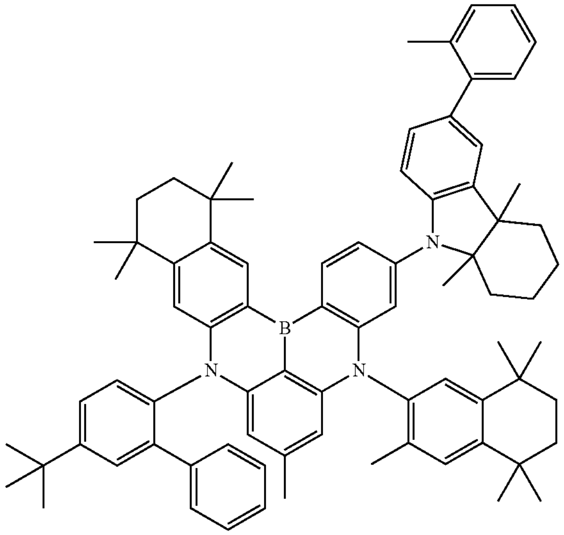

-continued
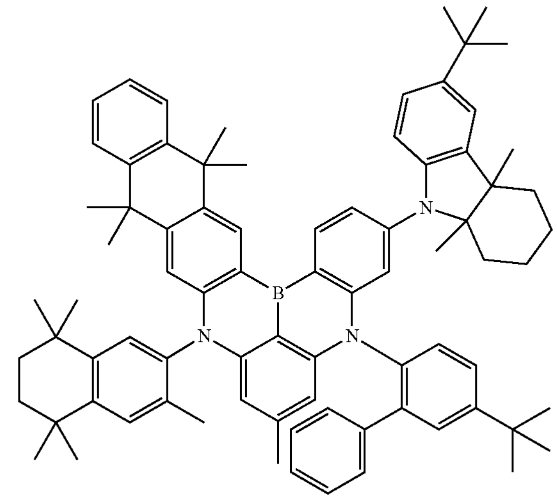
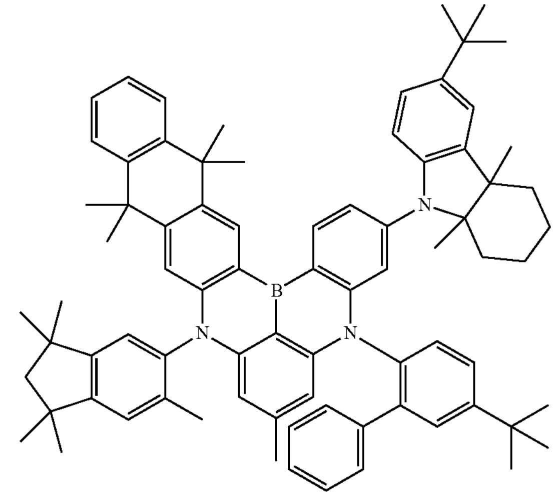
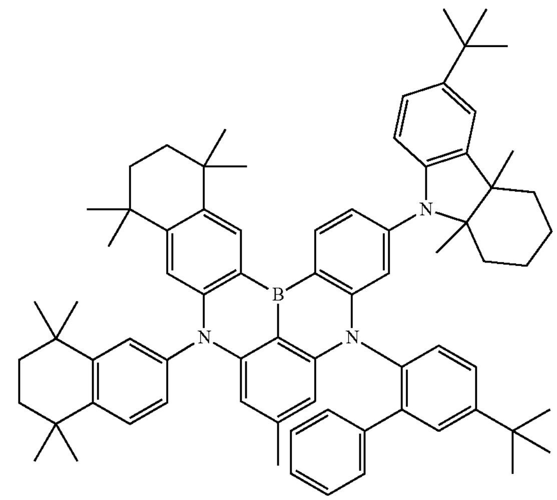
-continued
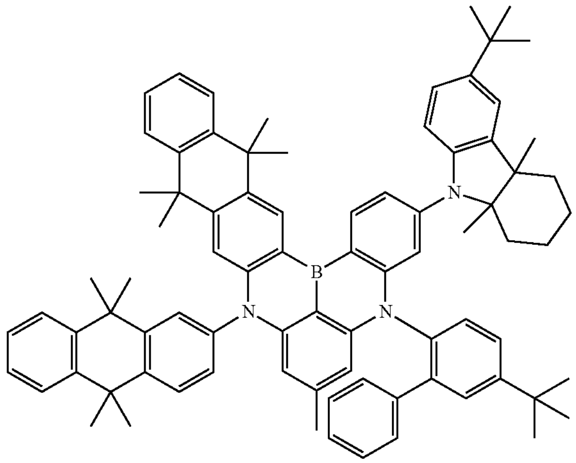
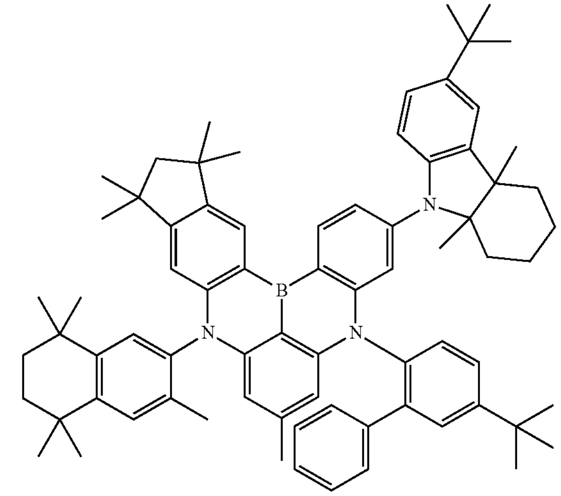
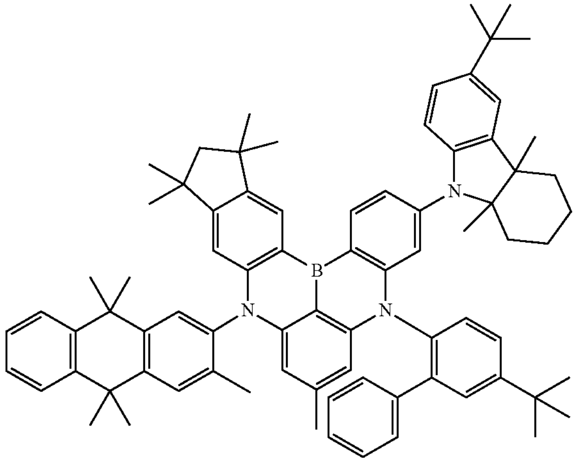

-continued
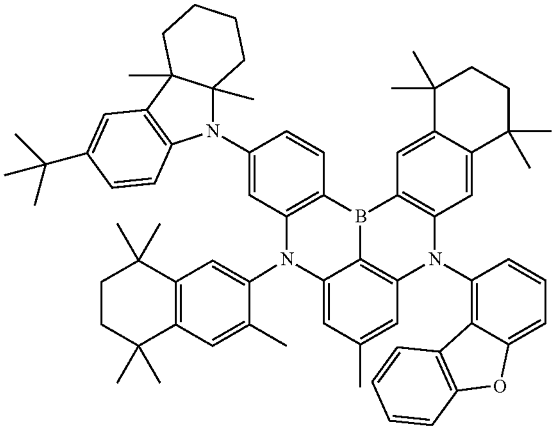
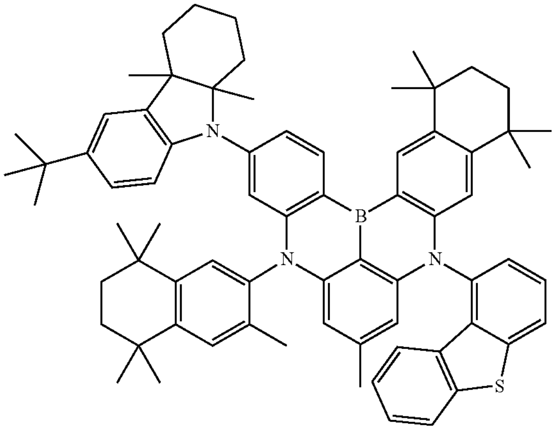
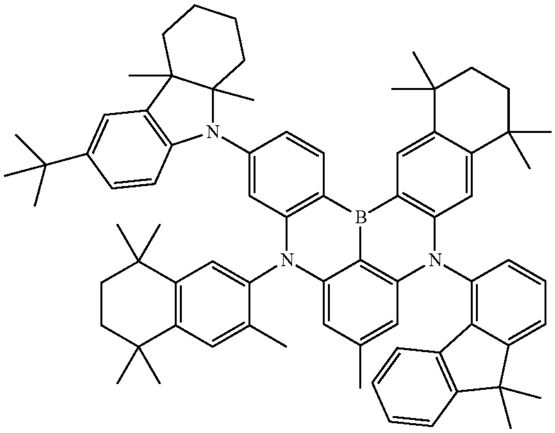
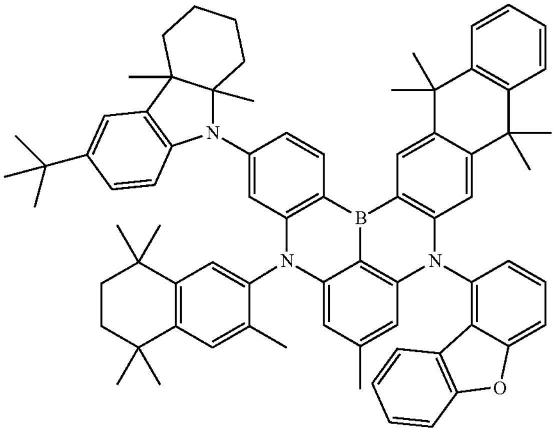
-continued
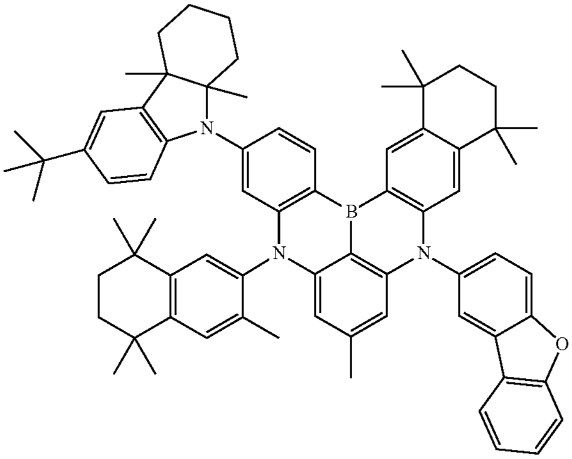
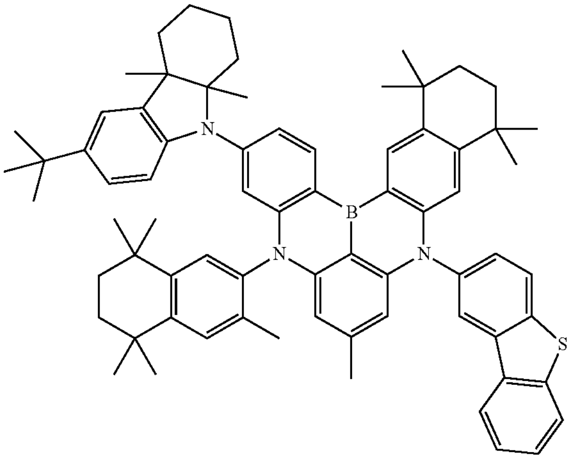
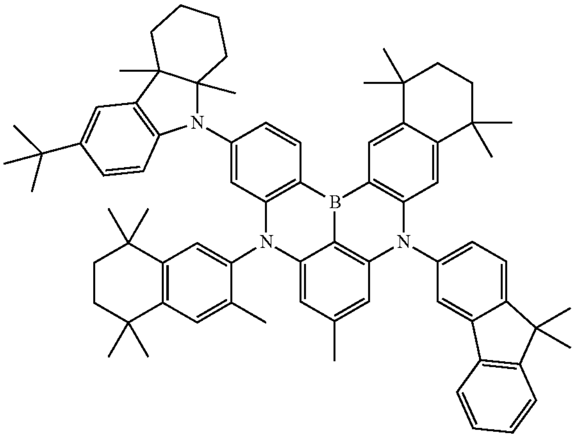

-continued
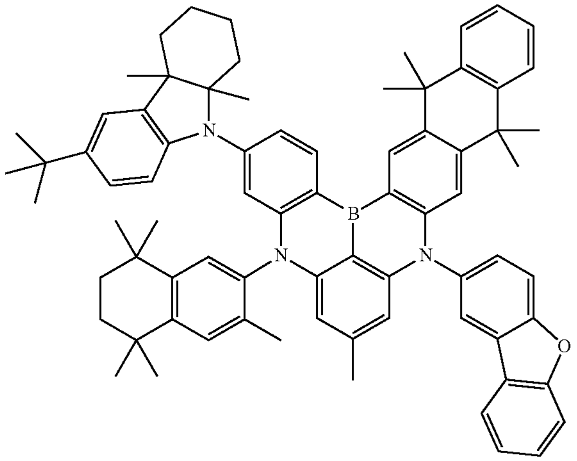
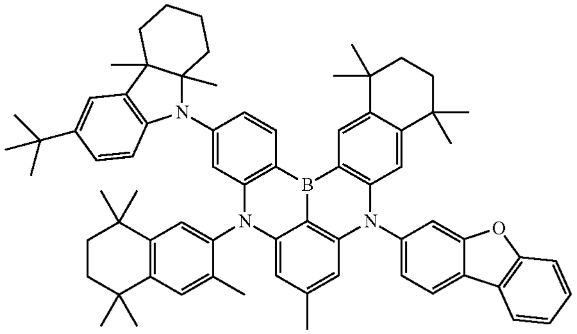
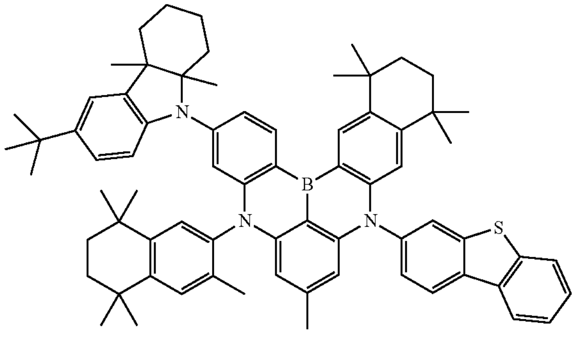
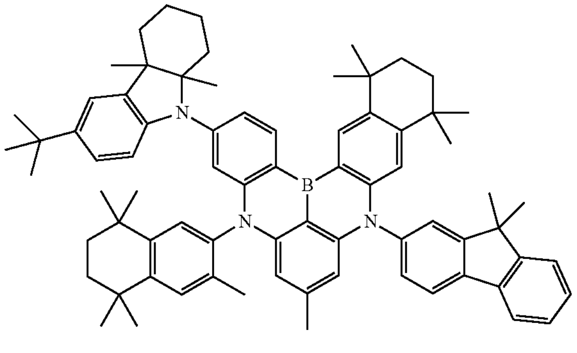
-continued
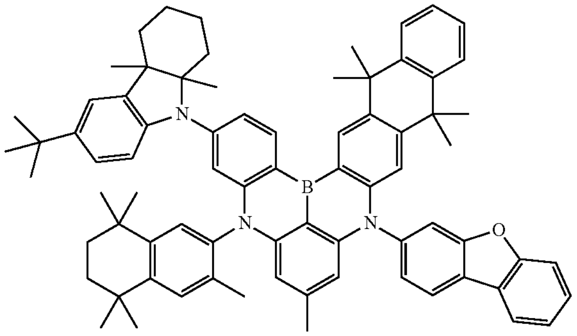
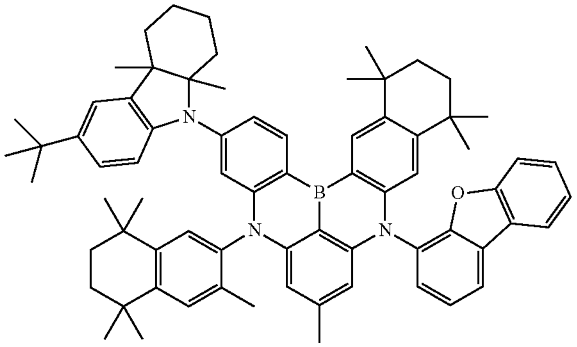
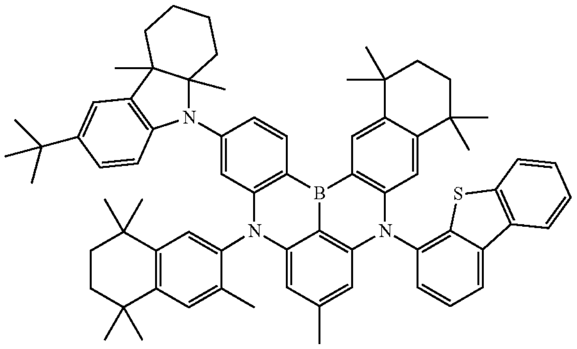
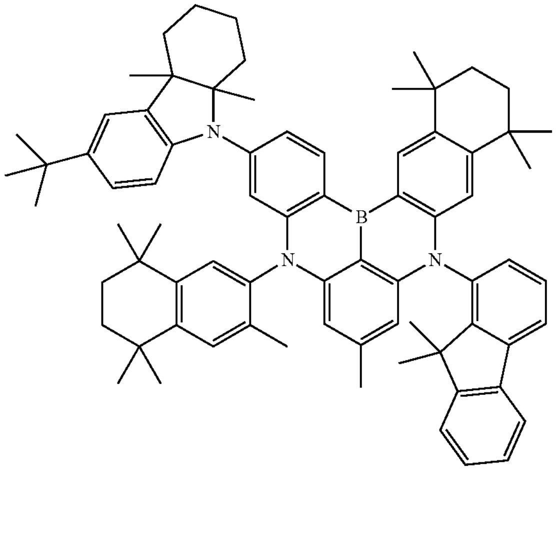

-continued
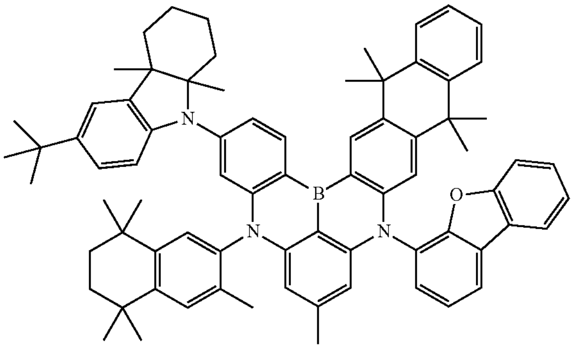
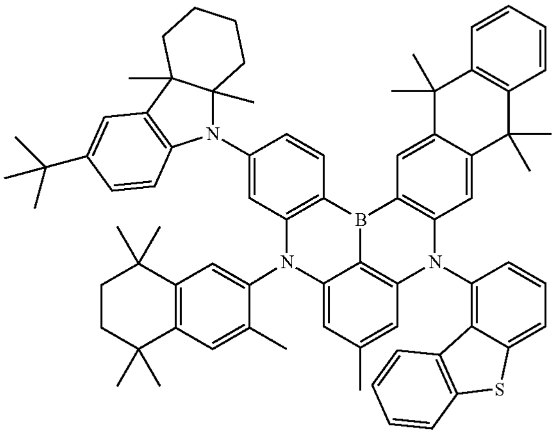
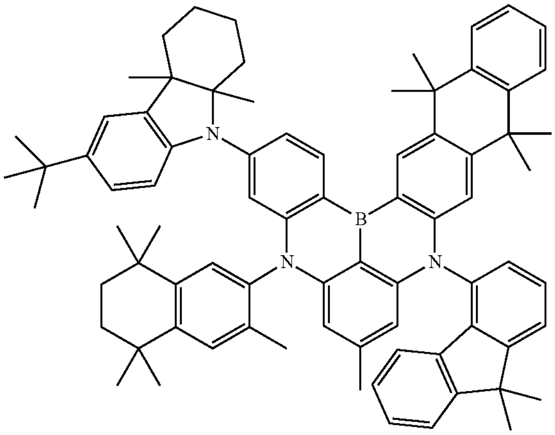
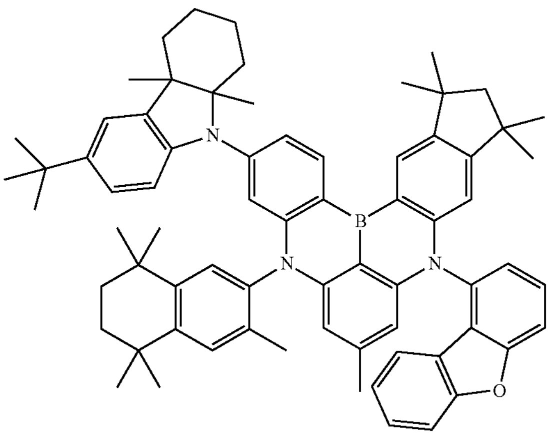
-continued
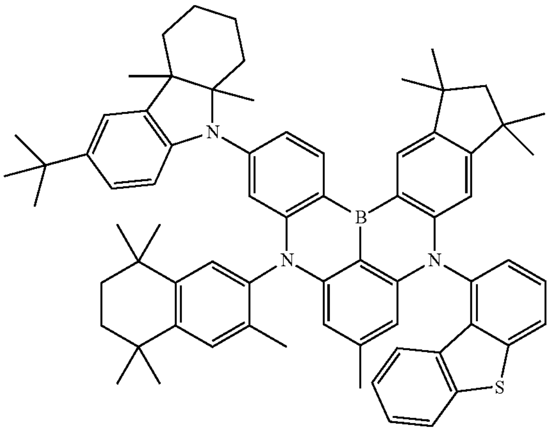
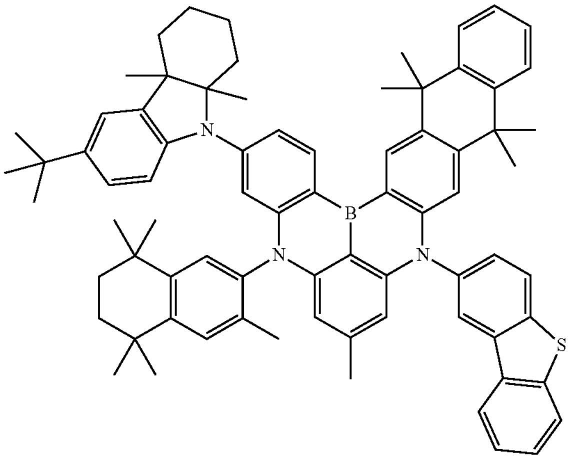
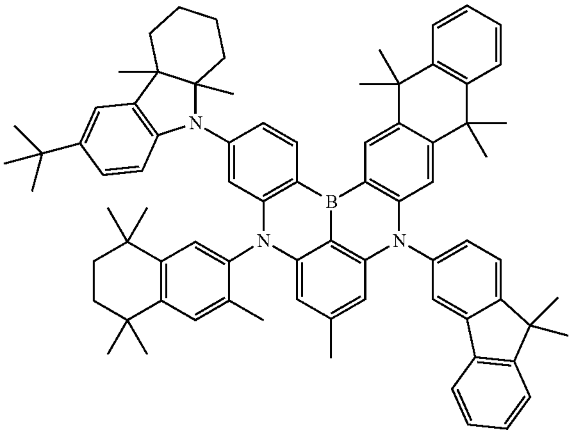

-continued
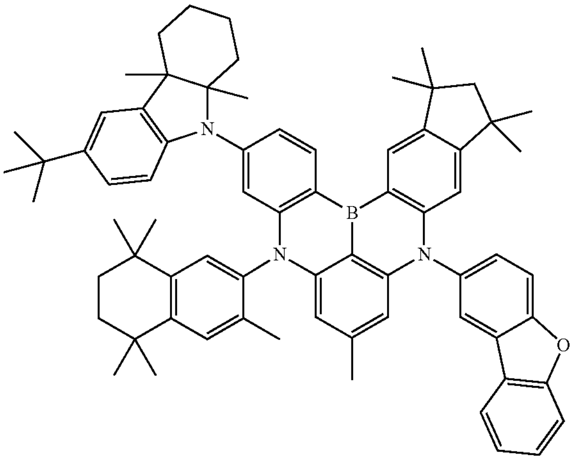
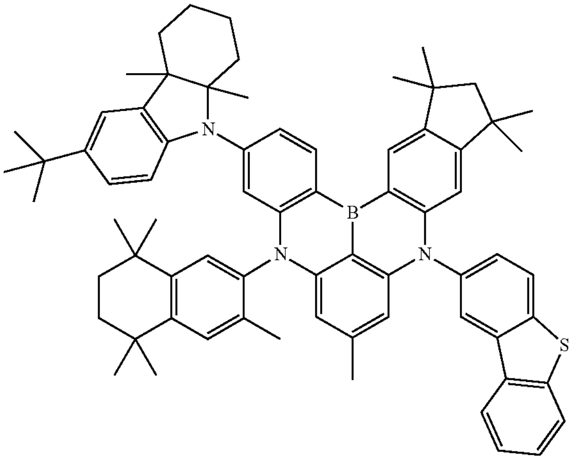
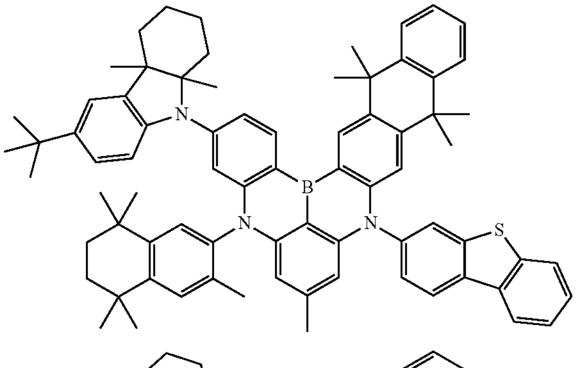
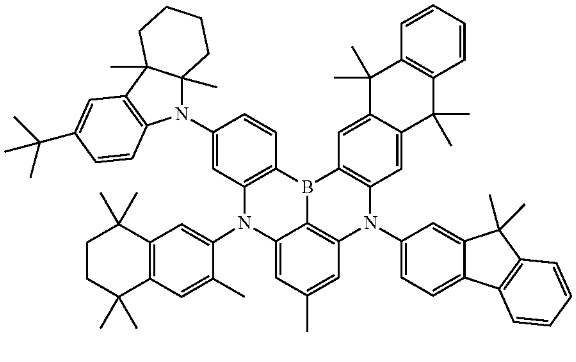
-continued
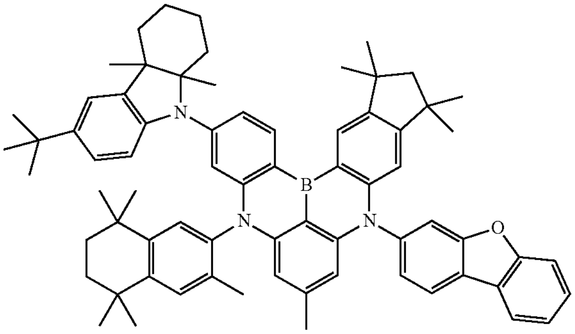
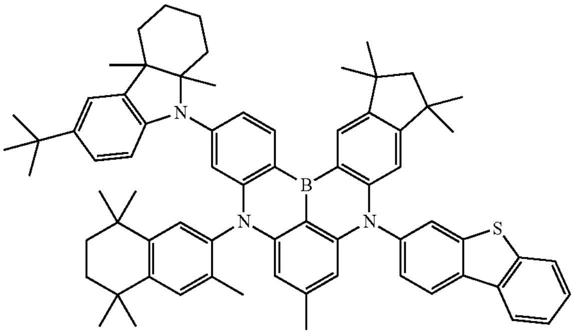
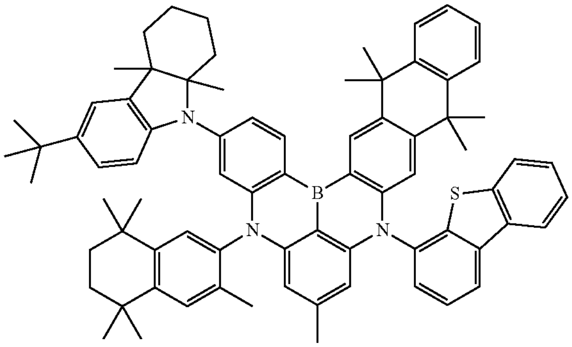
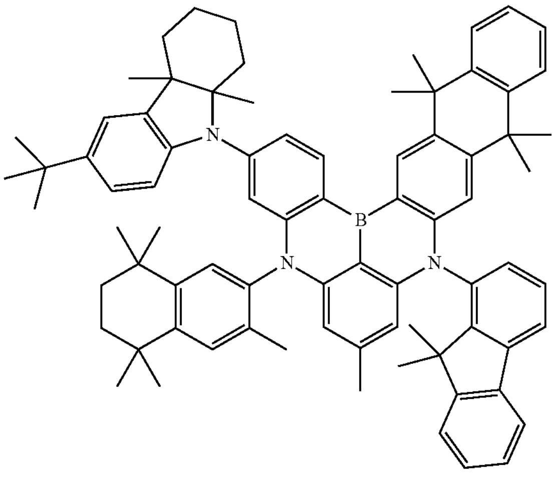

-continued
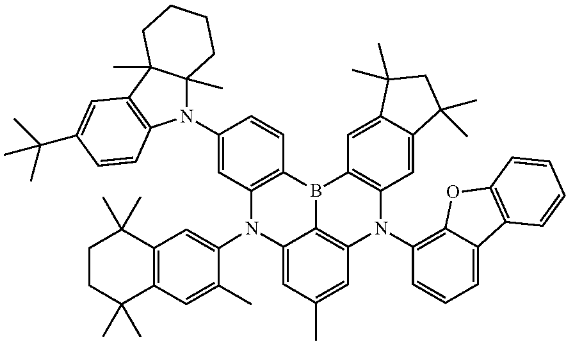
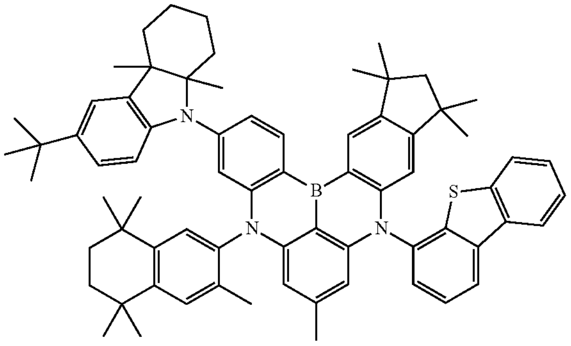
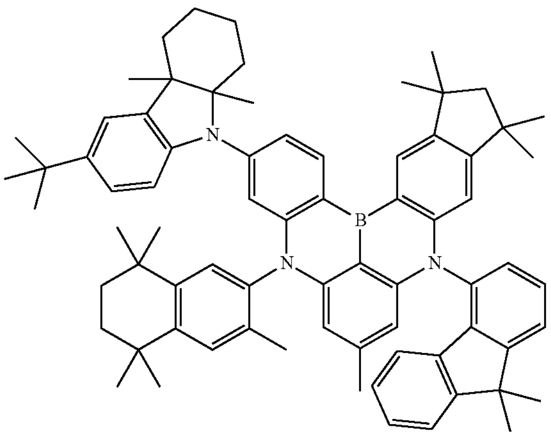
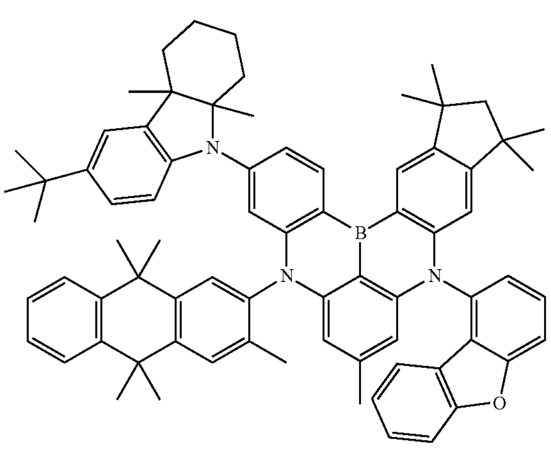
-continued
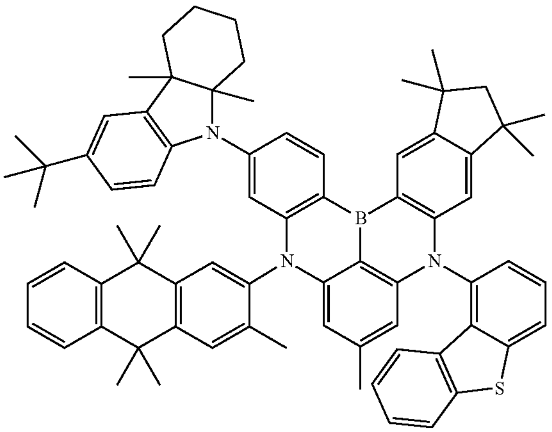
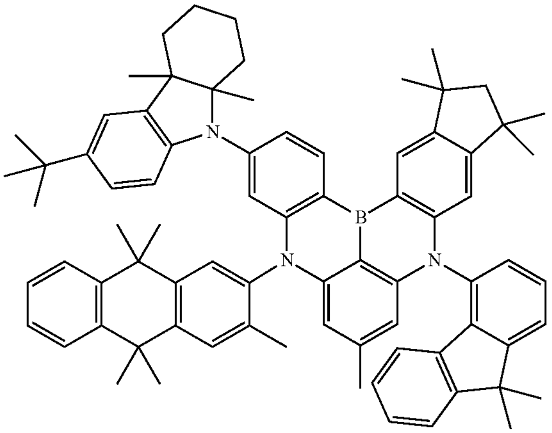
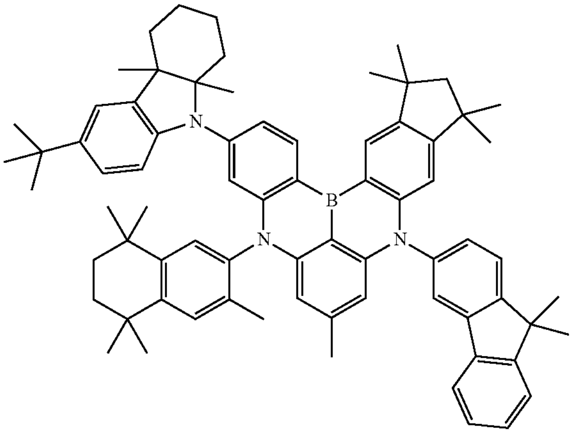

-continued
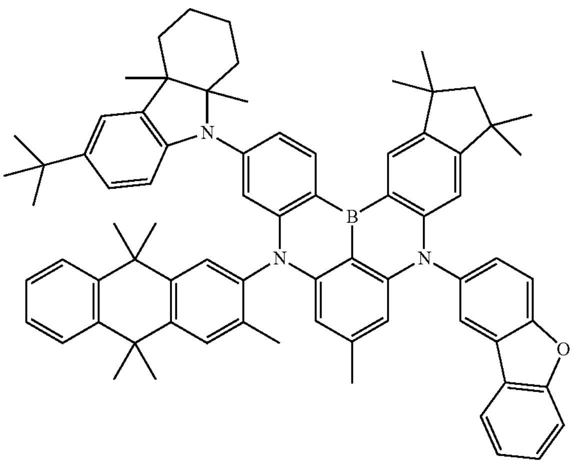
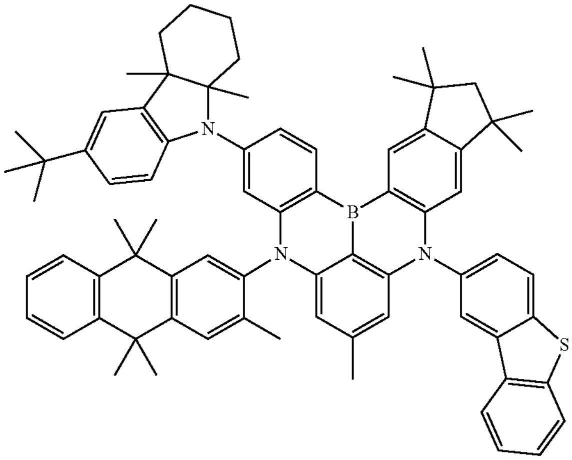
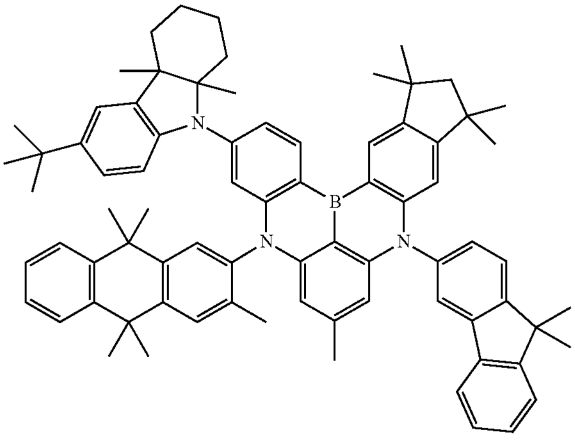
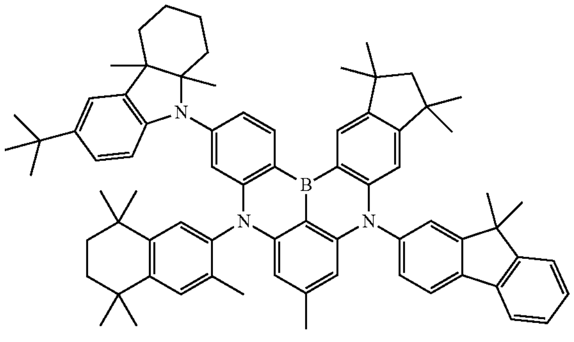
-continued
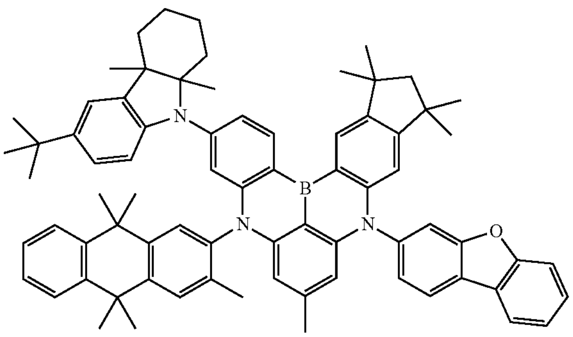
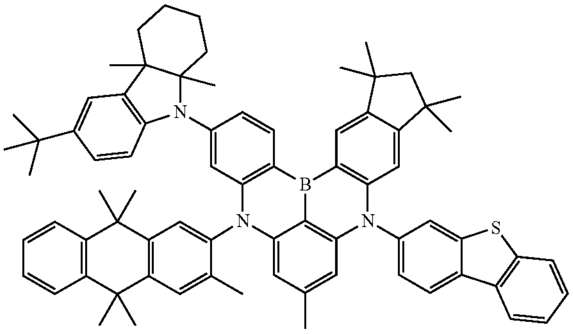
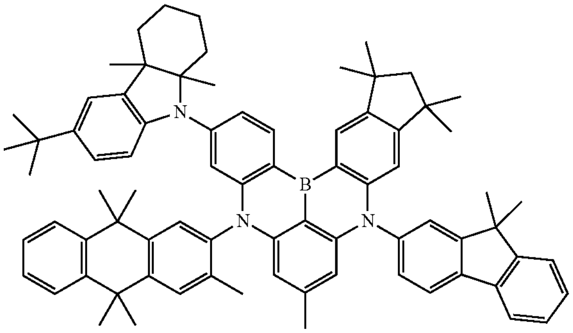
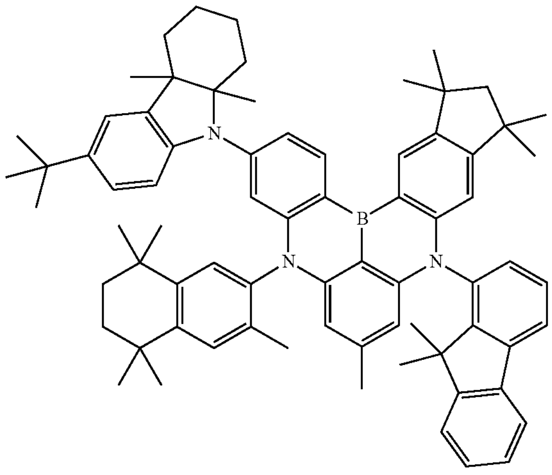

-continued
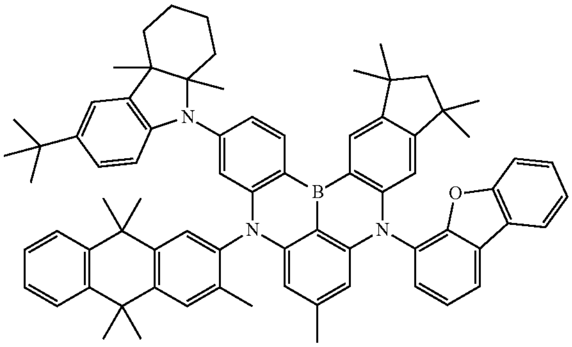
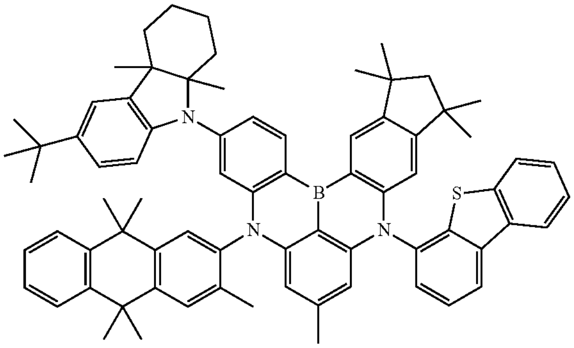
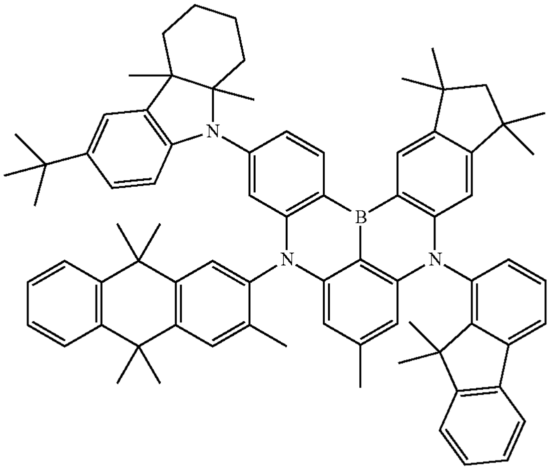
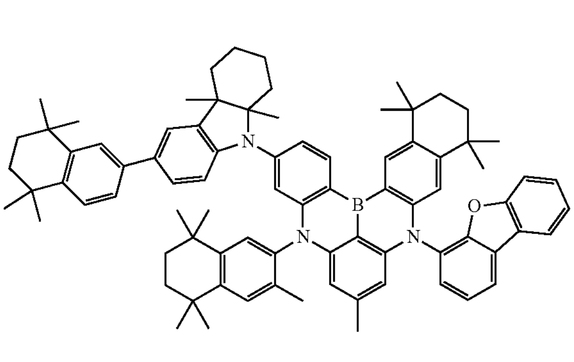
-continued
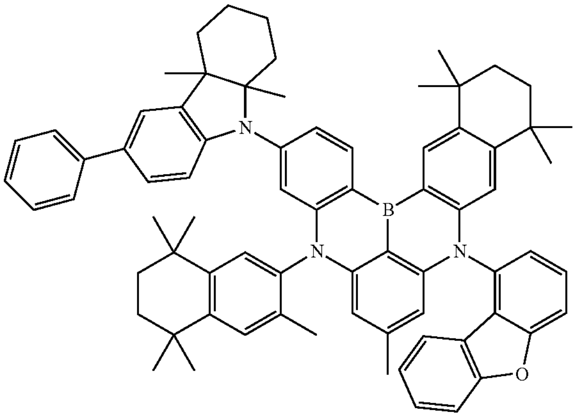
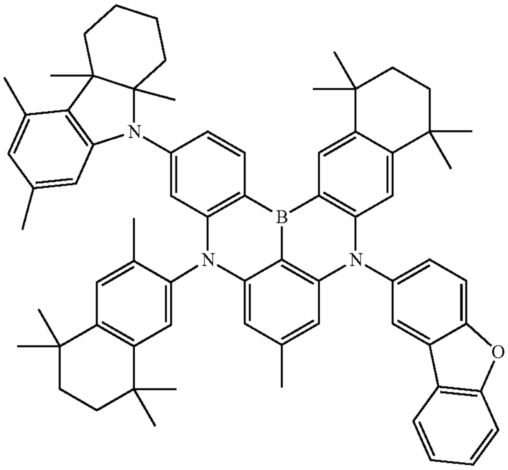
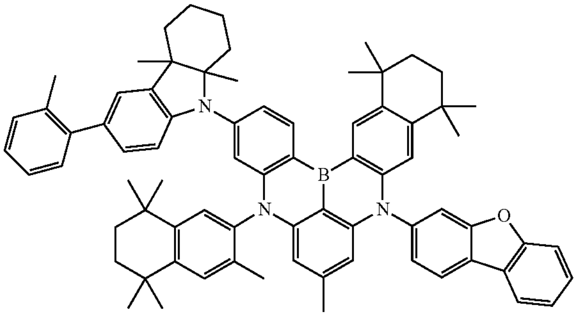

-continued
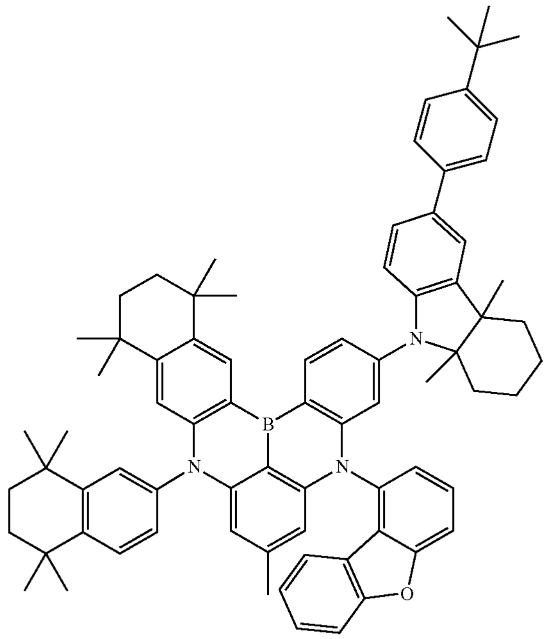
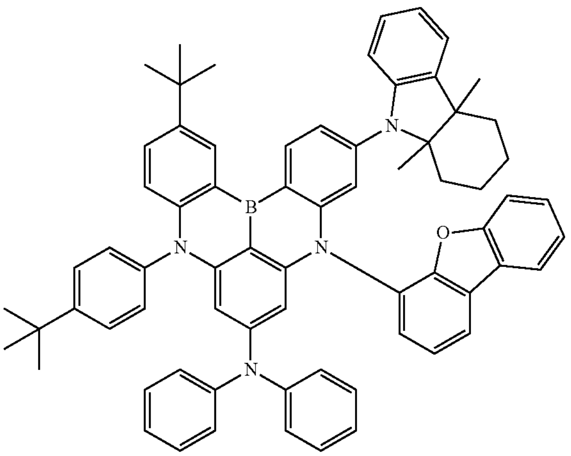
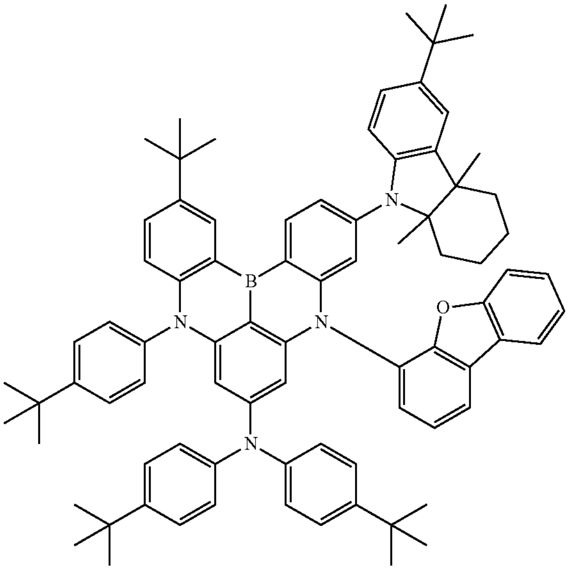
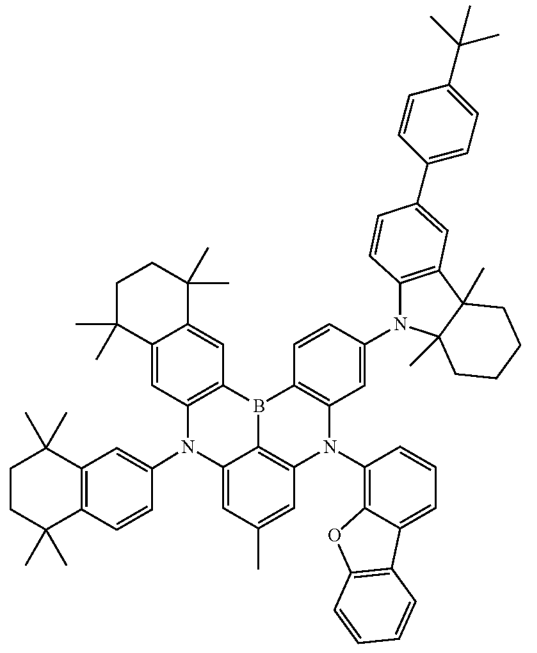
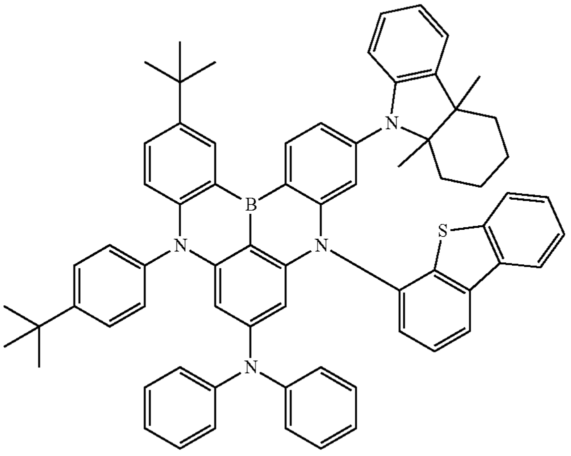

-continued
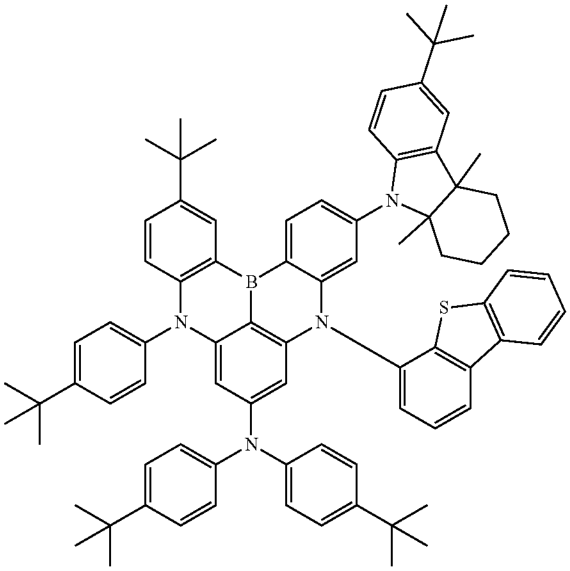 [SMILES: CC(C)(C)c1ccc(N(c2ccc(C(C)(C)C)cc2)c2cc3c4c(c2)N(c2cccc5c2sc2ccccc25)c2cc(N5c6ccc(C(C)(C)C)cc6C6(C)CCCCC56C)ccc2B4c2cc(C(C)(C)C)ccc2N3c2ccc(C(C)(C)C)cc2)cc1]
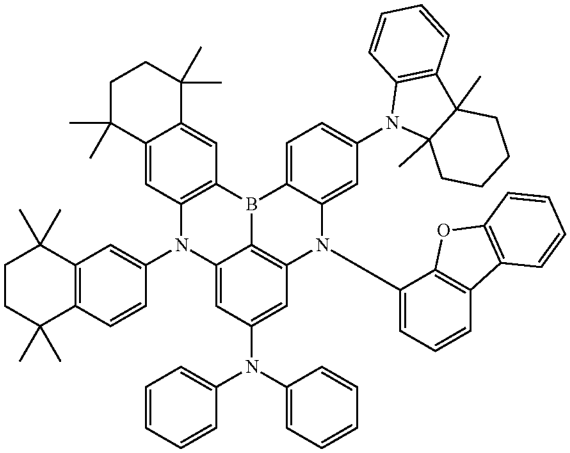
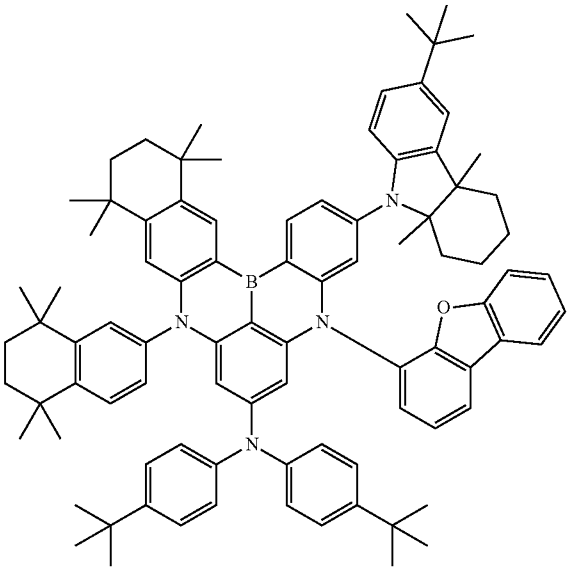
-continued
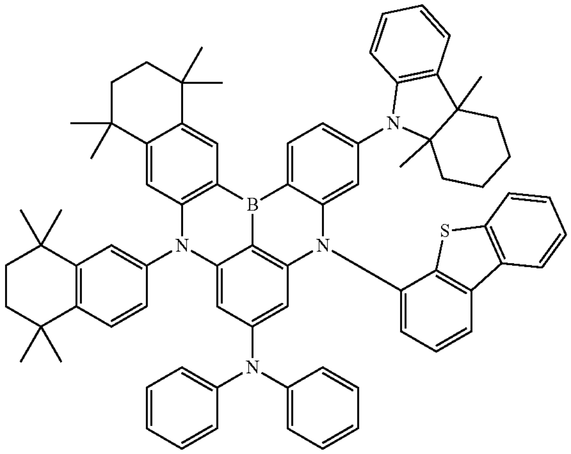
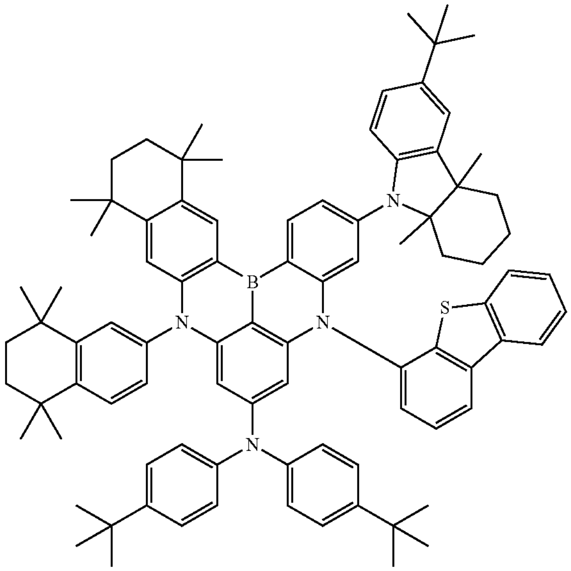 [SMILES: CC(C)(C)c1ccc(N(c2ccc(C(C)(C)C)cc2)c2cc3c4c(c2)N(c2cccc5c2sc2ccccc25)c2cc(N5c6ccc(C(C)(C)C)cc6C6(C)CCCCC56C)ccc2B4c2cc4c(cc2N3c2ccc3c(c2)C(C)(C)CCC3(C)C)C(C)(C)CCC4(C)C)cc1]
p
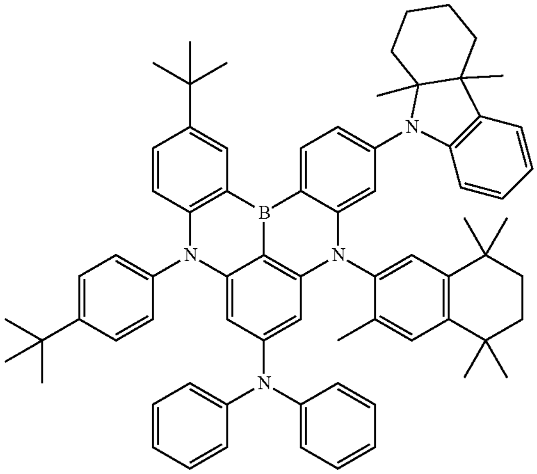

-continued
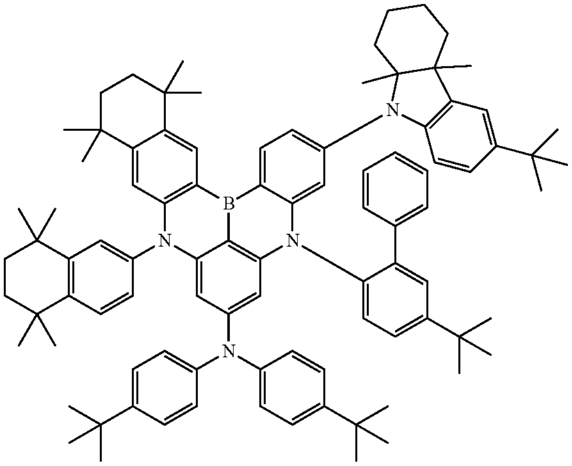
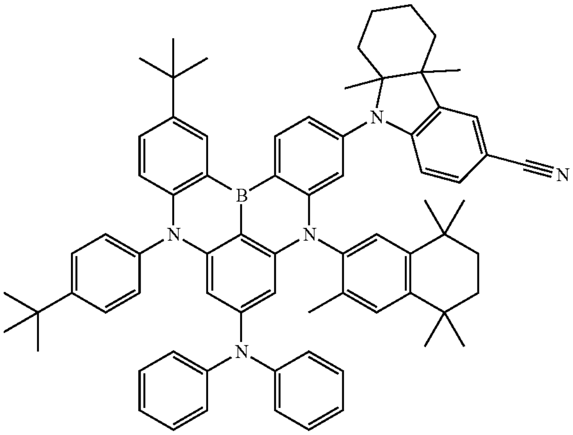
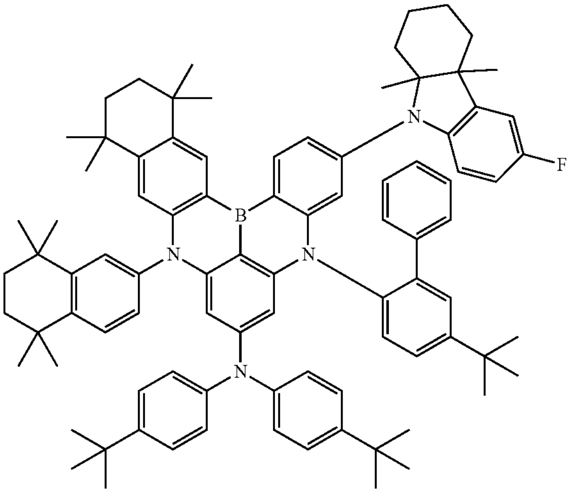 [SMILES: CC(C)(C)c1ccc(N(c2ccc(C(C)(C)C)cc2)c2cc3c4c(c2)N(c2ccc(C(C)(C)C)cc2-c2ccccc2)c2cc(N5c6ccc(F)cc6C6(C)CCCCC56C)ccc2B4c2cc4c(cc2N3c2ccc3c(c2)C(C)(C)CCC3(C)C)C(C)(C)CCC4(C)C)cc1]
-continued
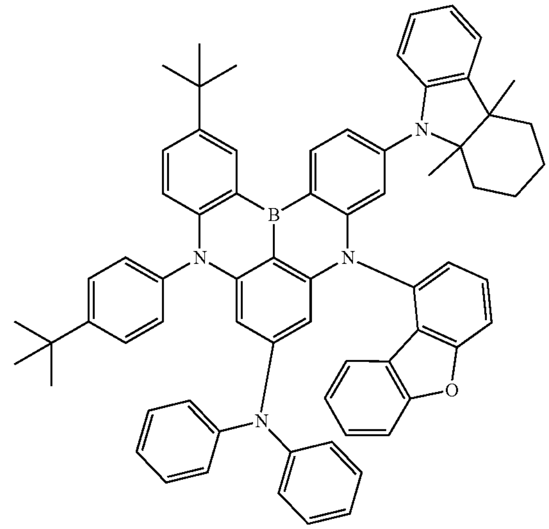
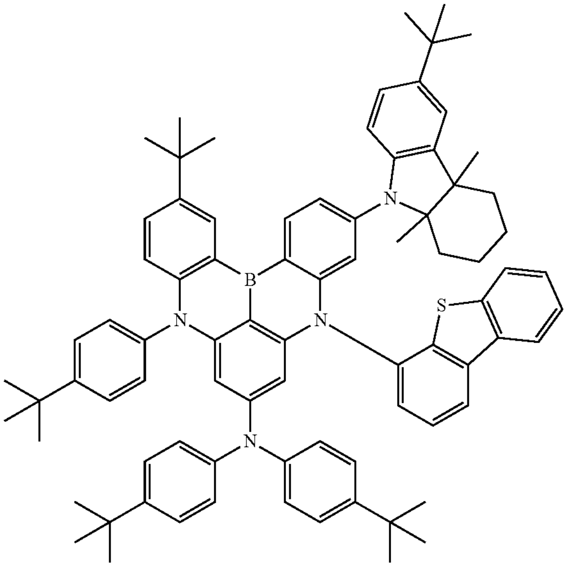
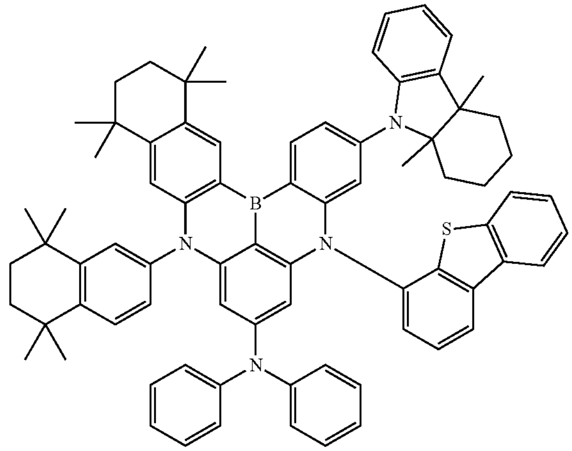

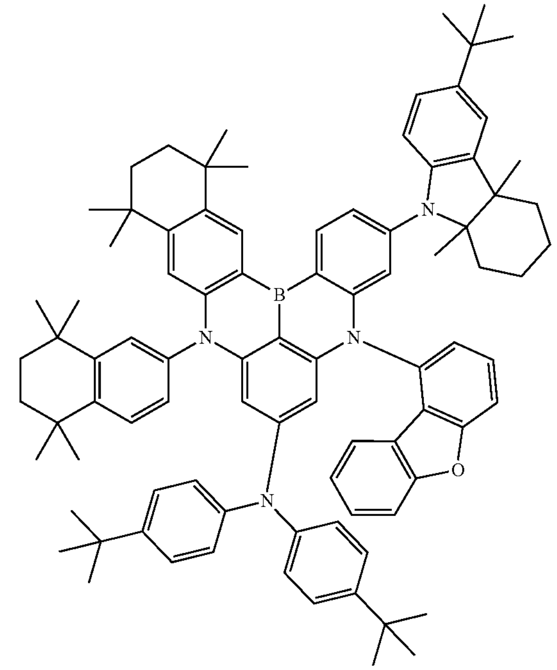 [SMILES: CC(C)(C)c1ccc(N(c2ccc(C(C)(C)C)cc2)c2cc3c4c(c2)N(c2cccc5oc6ccccc6c25)c2cc(N5c6ccc(C(C)(C)C)cc6C6(C)CCCCC56C)ccc2B4c2cc4c(cc2N3c2ccc3c(c2)C(C)(C)CCC3(C)C)C(C)(C)CCC4(C)C)cc1]
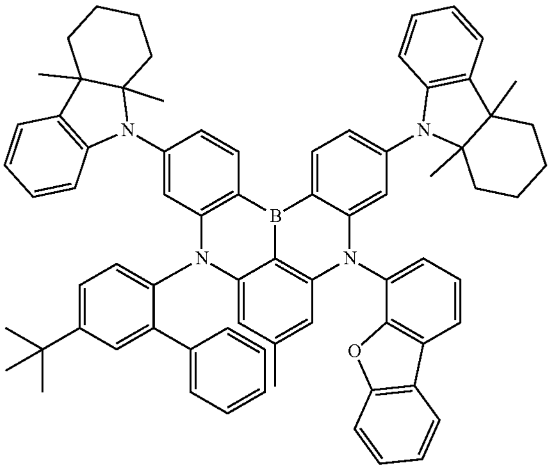
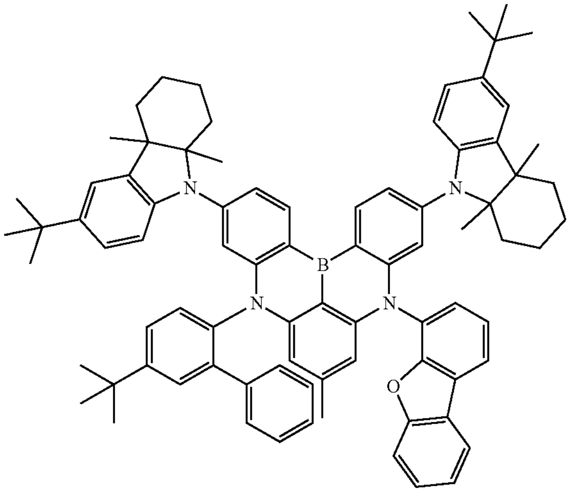
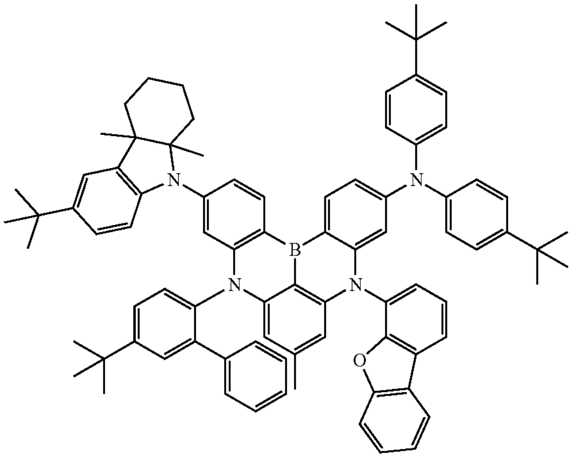
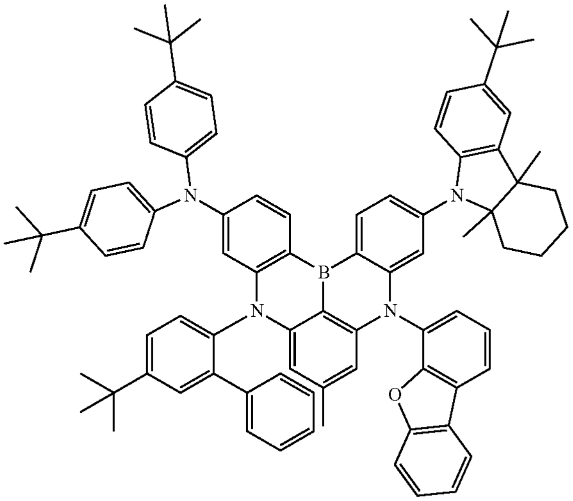 [SMILES: Cc1cc2c3c(c1)N(c1cccc4c1oc1ccccc14)c1cc(N4c5ccc(C(C)(C)C)cc5C5(C)CCCCC45C)ccc1B3c1ccc(N(c3ccc(C(C)(C)C)cc3)c3ccc(C(C)(C)C)cc3)cc1N2c1ccc(C(C)(C)C)cc1-c1ccccc1]
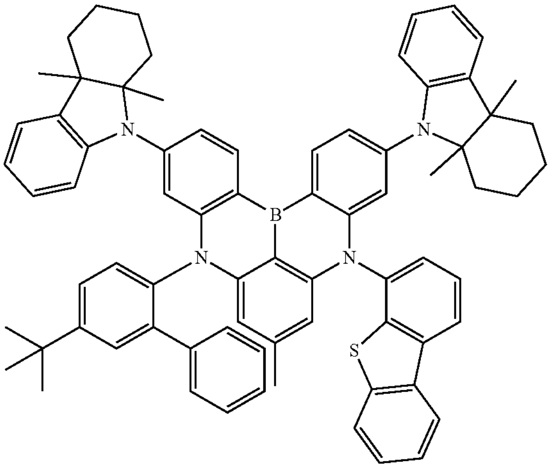

-continued
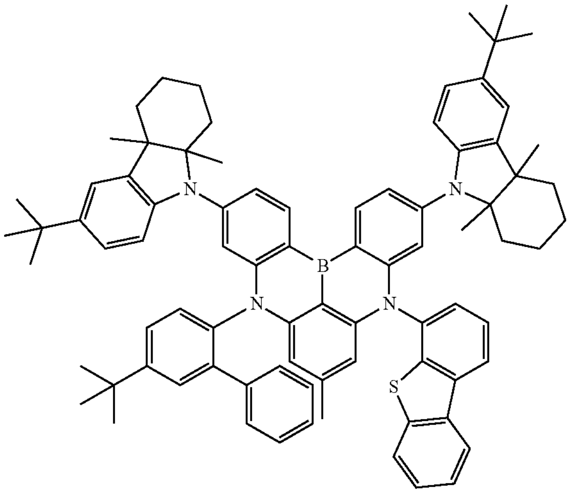
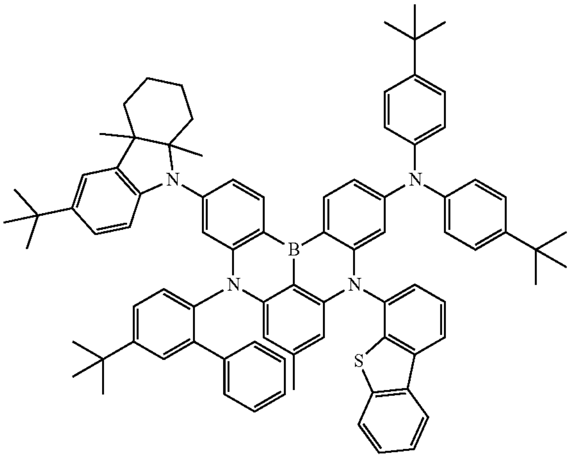
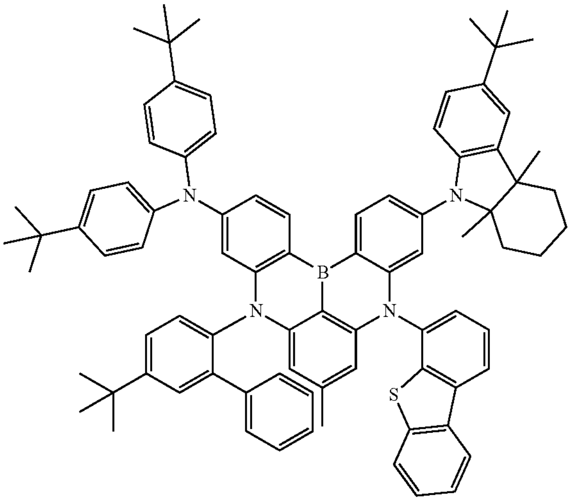 [SMILES: Cc1cc2c3c(c1)N(c1cccc4c1sc1ccccc14)c1cc(N4c5ccc(C(C)(C)C)cc5C5(C)CCCCC45C)ccc1B3c1ccc(N(c3ccc(C(C)(C)C)cc3)c3ccc(C(C)(C)C)cc3)cc1N2c1ccc(C(C)(C)C)cc1-c1ccccc1]
-continued
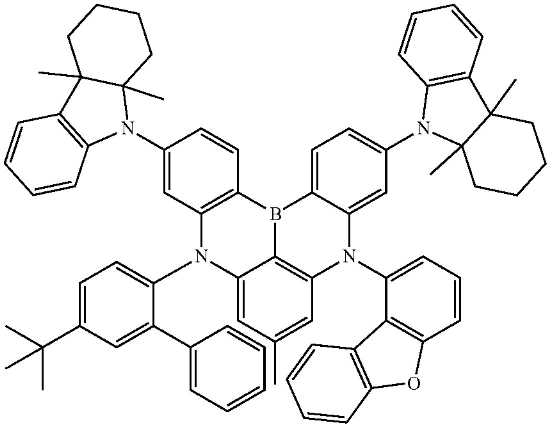
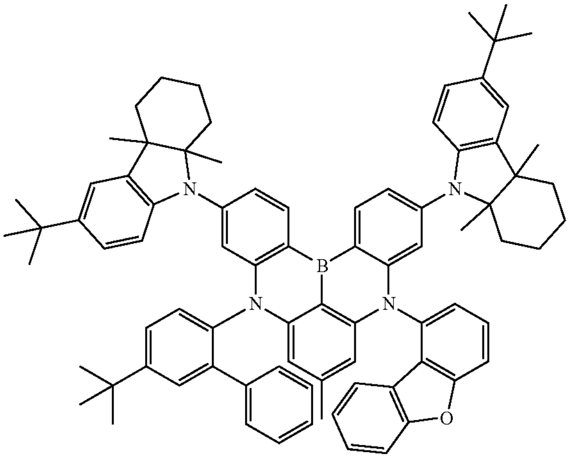
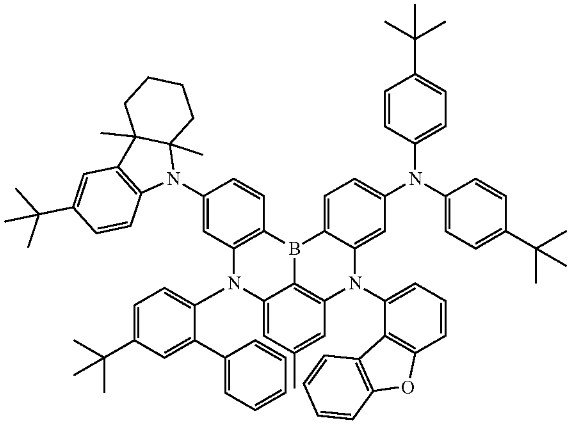

-continued
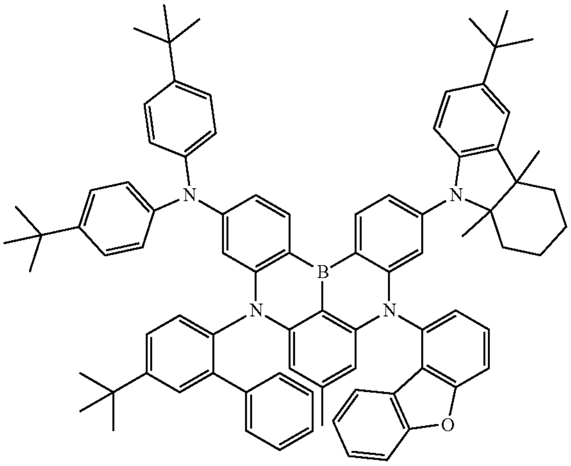 [SMILES: Cc1cc2c3c(c1)N(c1cccc4oc5ccccc5c14)c1cc(N4c5ccc(C(C)(C)C)cc5C5(C)CCCCC45C)ccc1B3c1ccc(N(c3ccc(C(C)(C)C)cc3)c3ccc(C(C)(C)C)cc3)cc1N2c1ccc(C(C)(C)C)cc1-c1ccccc1]
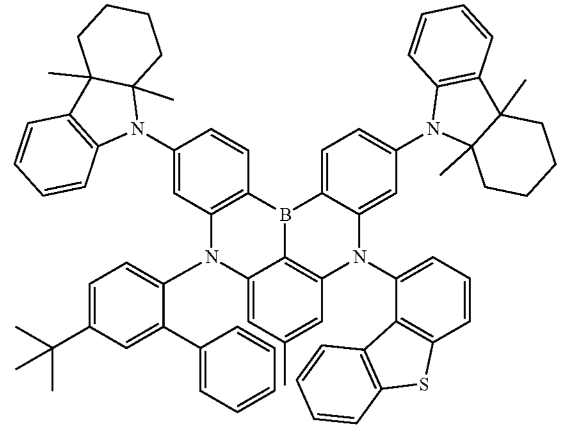
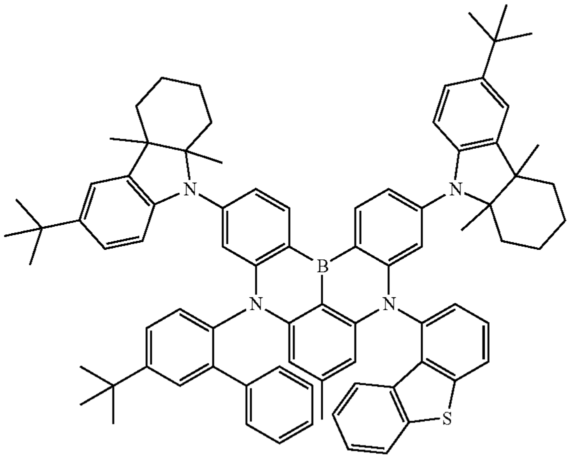
-continued
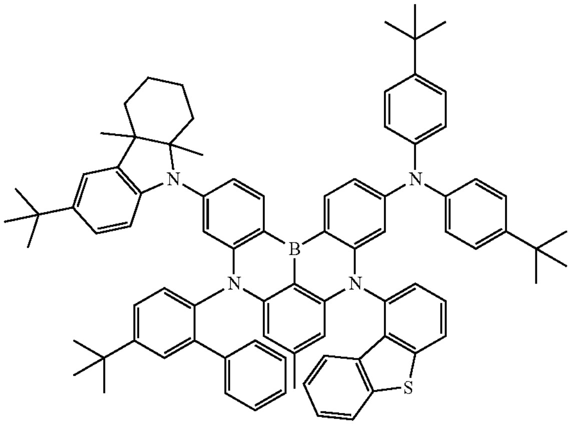
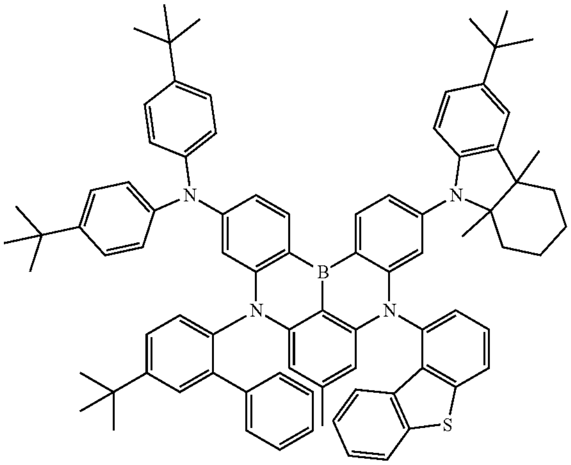
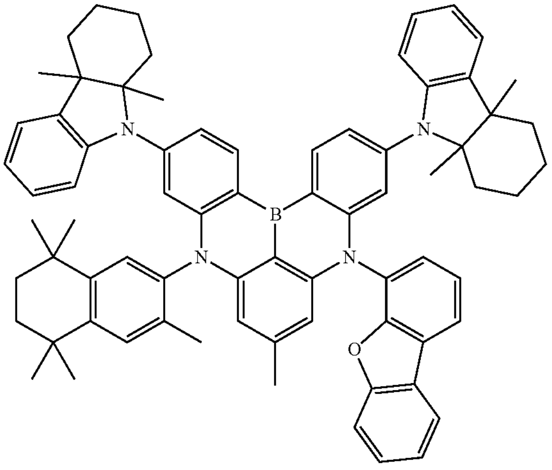

-continued
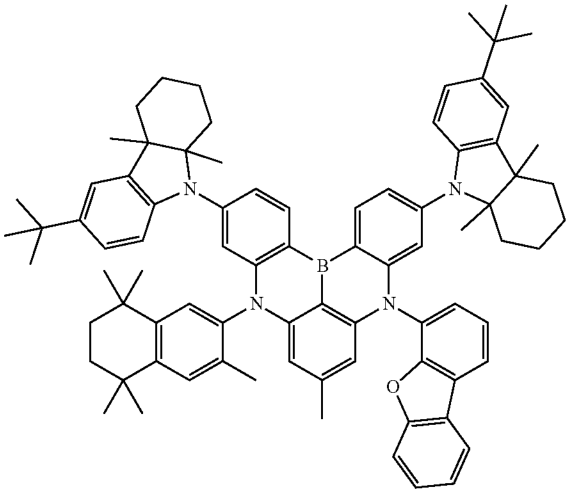
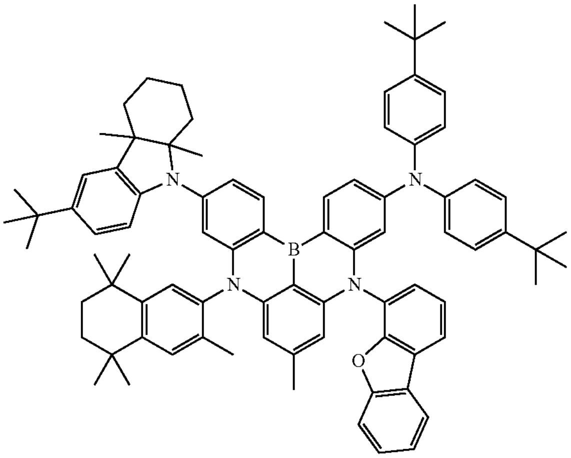
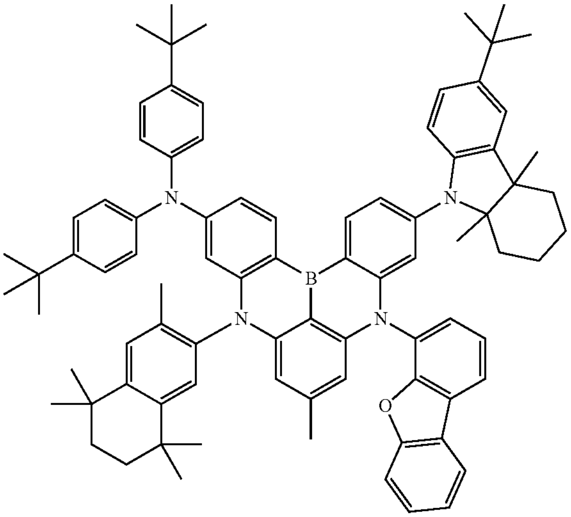
-continued
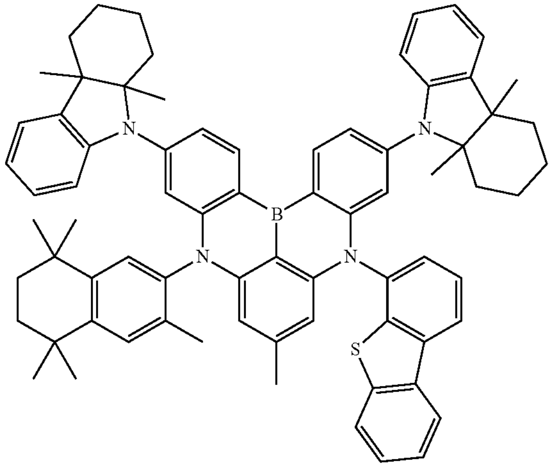
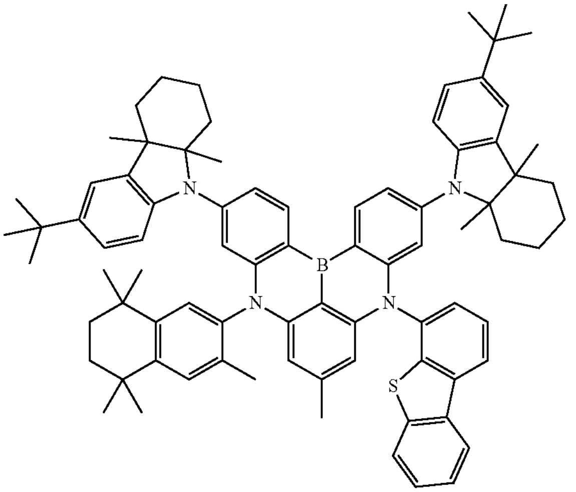
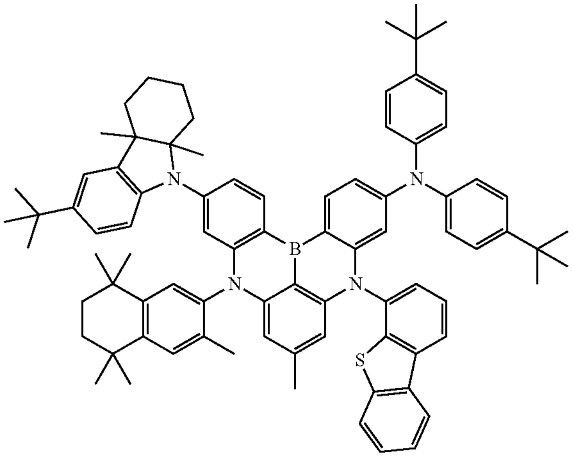

-continued
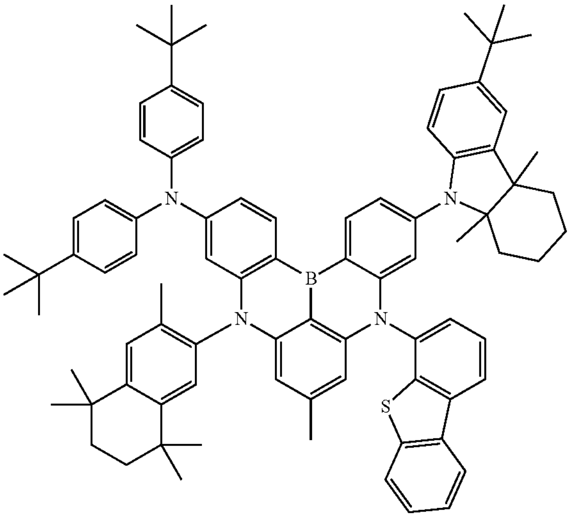
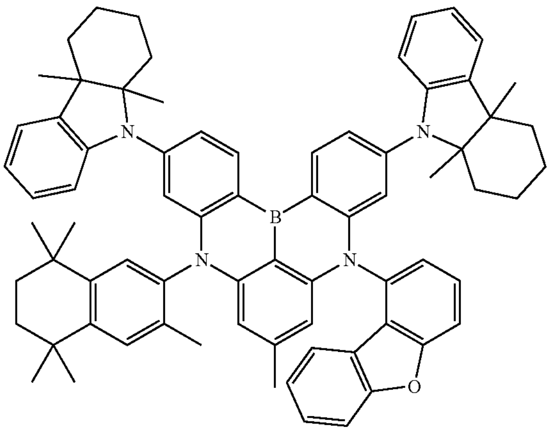
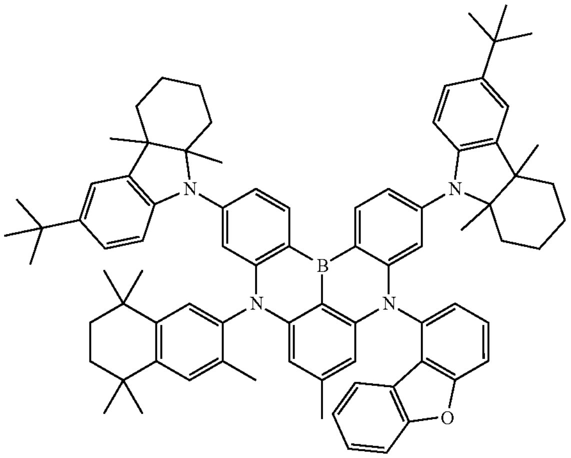
-continued
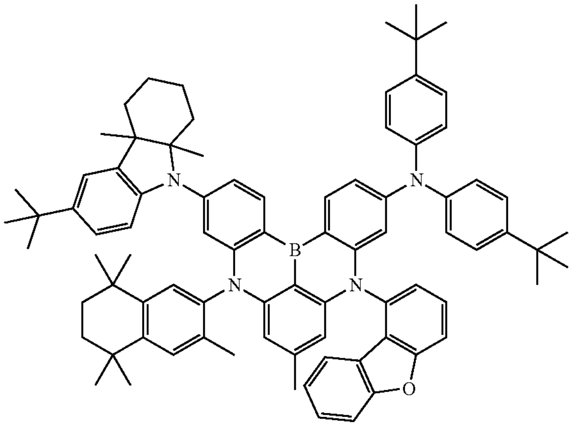
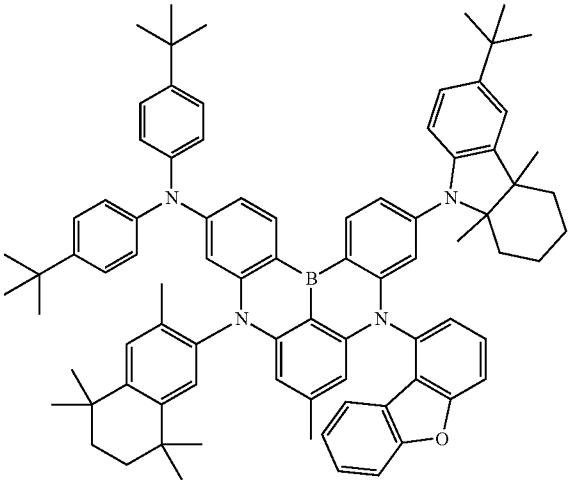
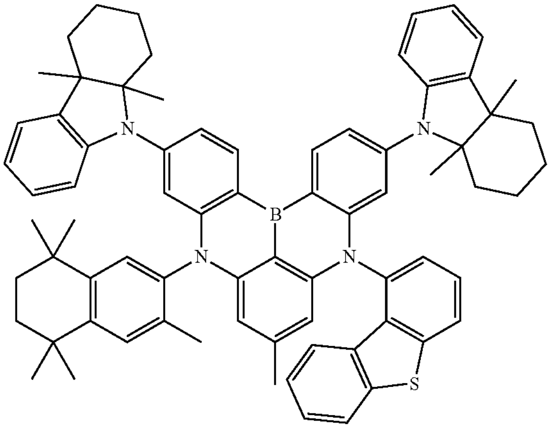

-continued
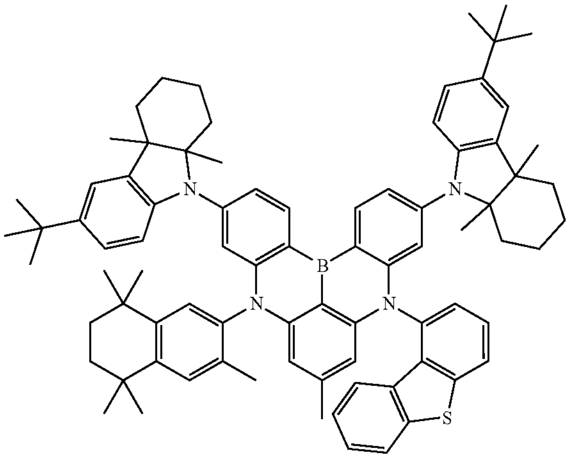
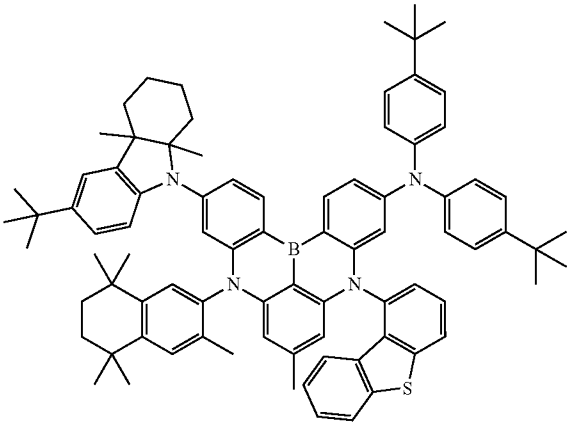
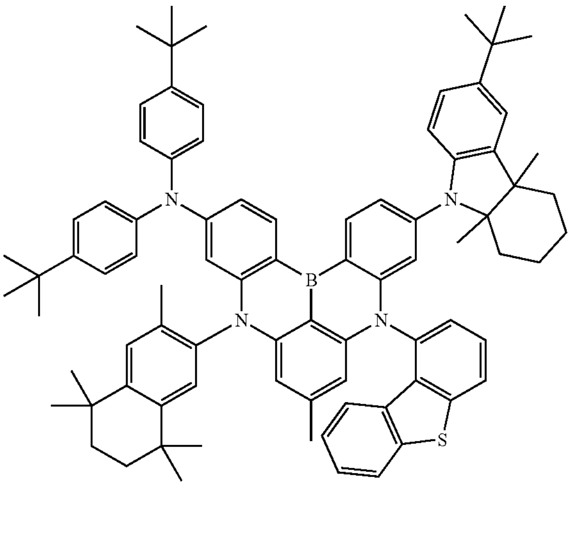
-continued
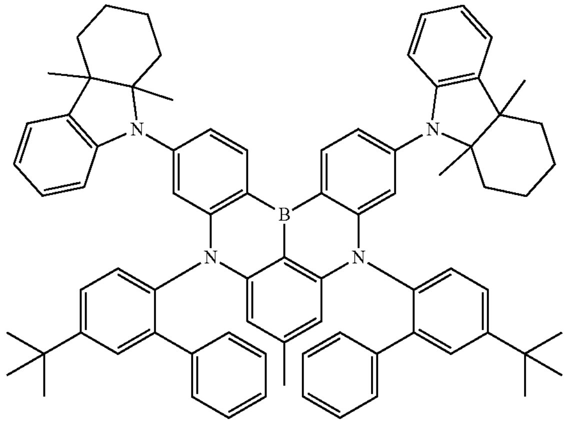
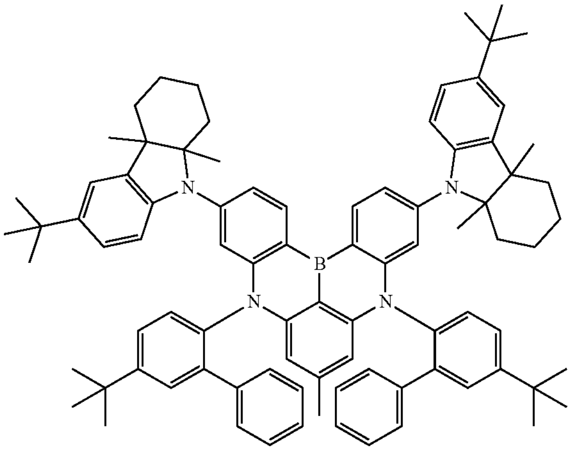
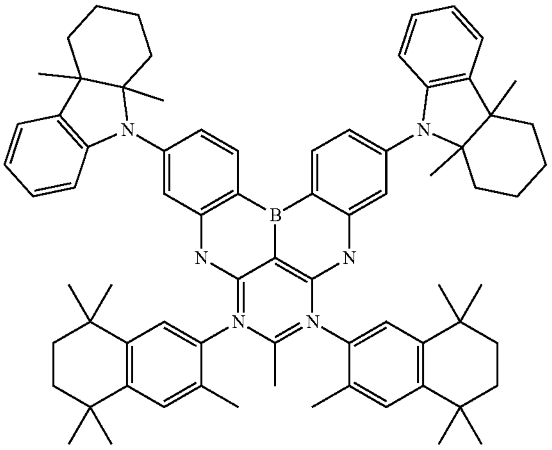

-continued
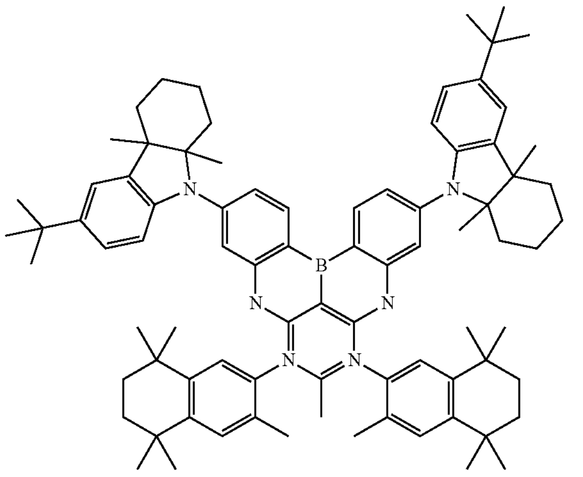
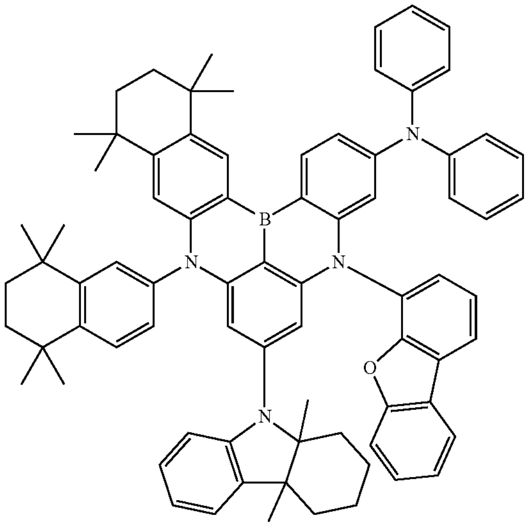
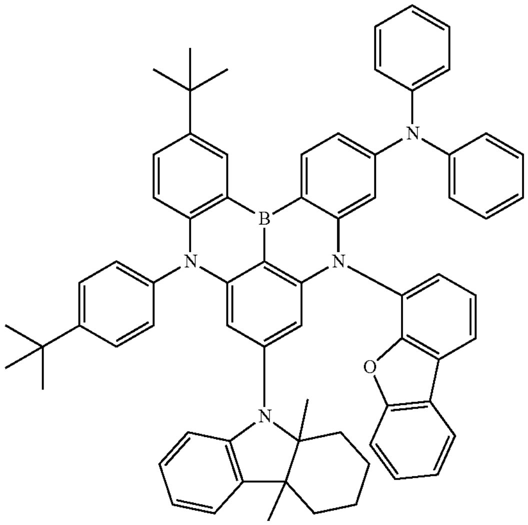
-continued
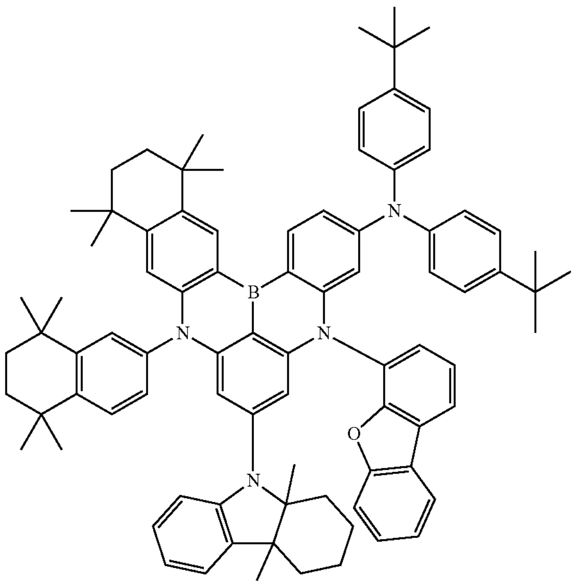
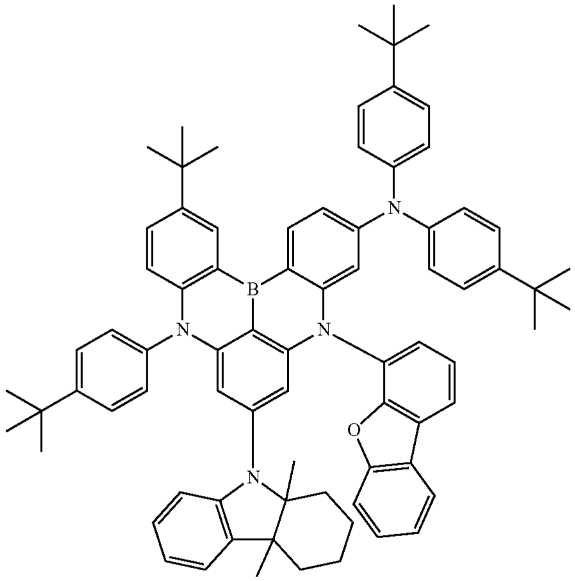

-continued
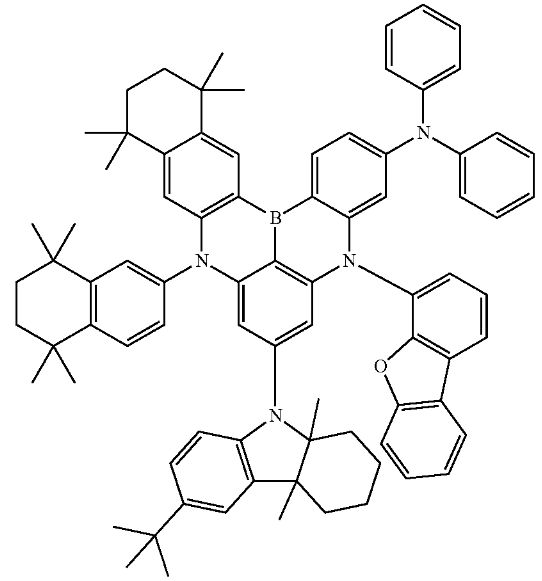
-continued
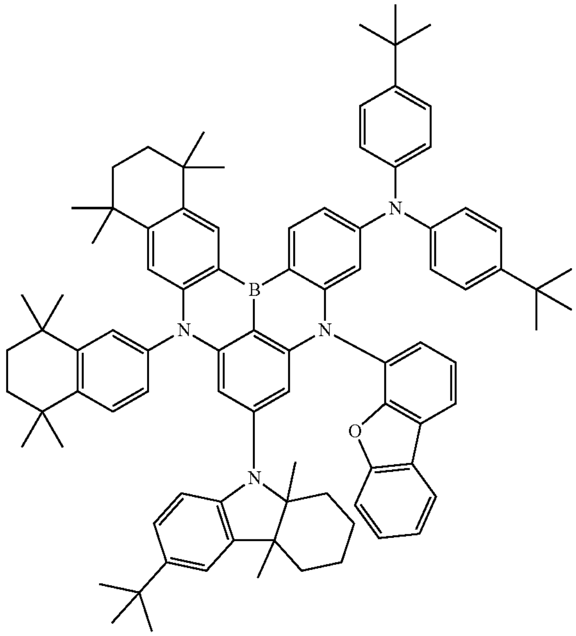
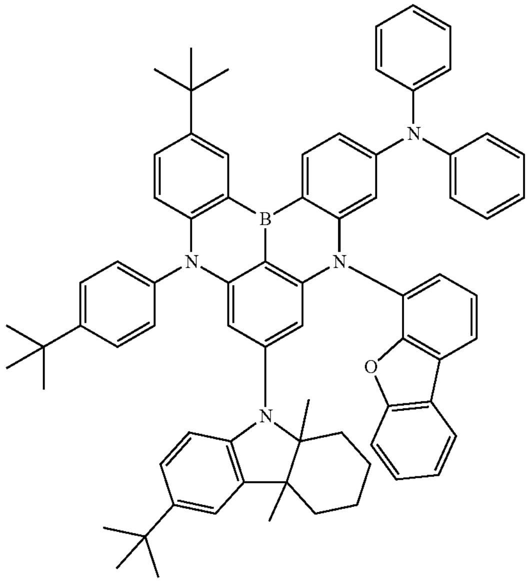
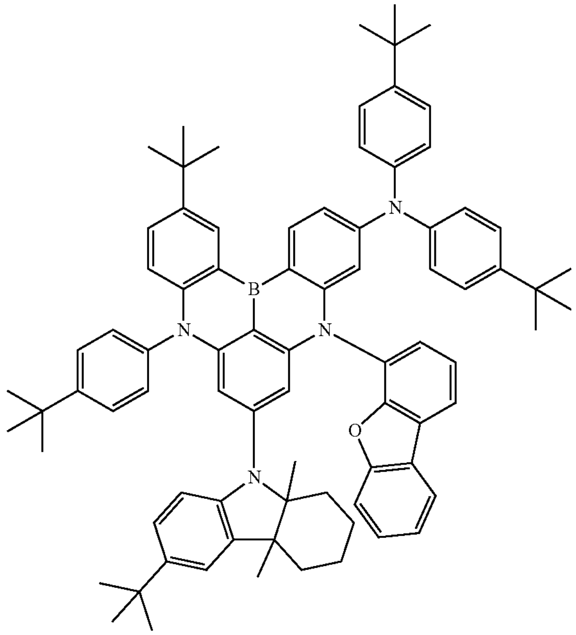

-continued
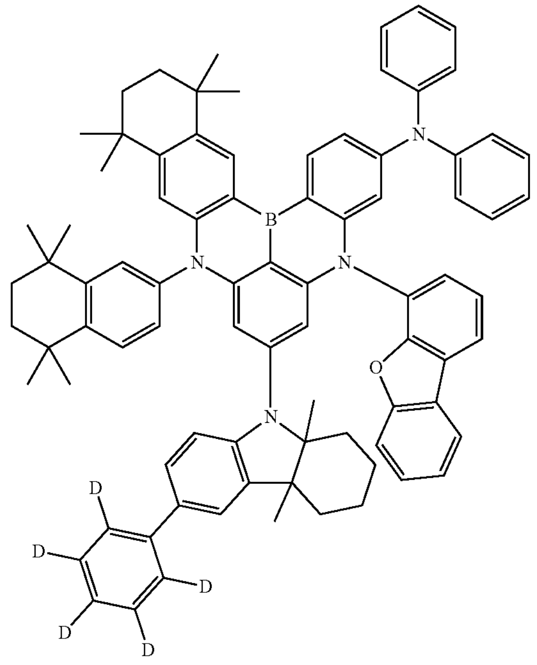
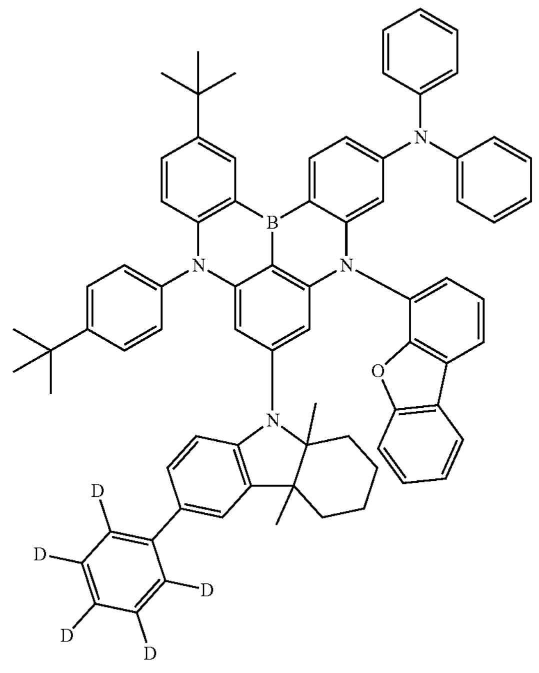
-continued
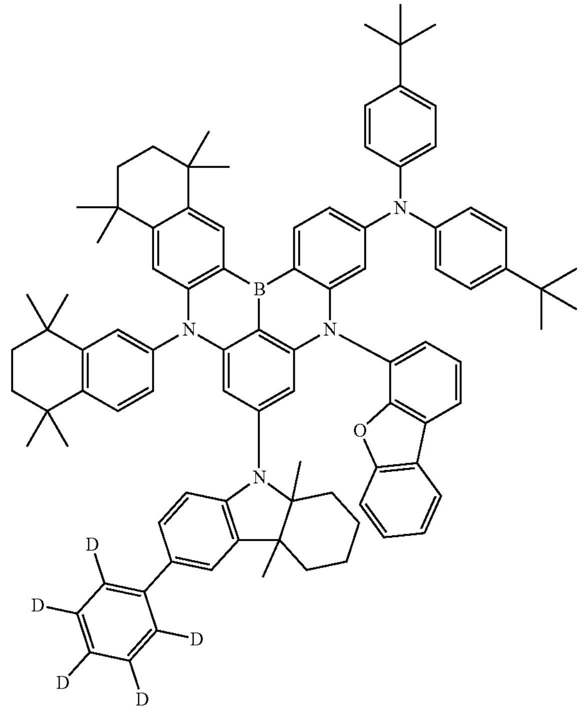
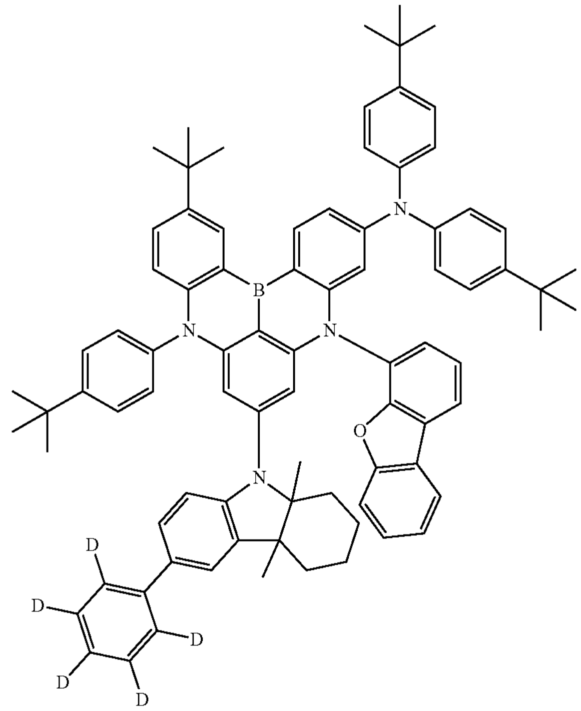

-continued
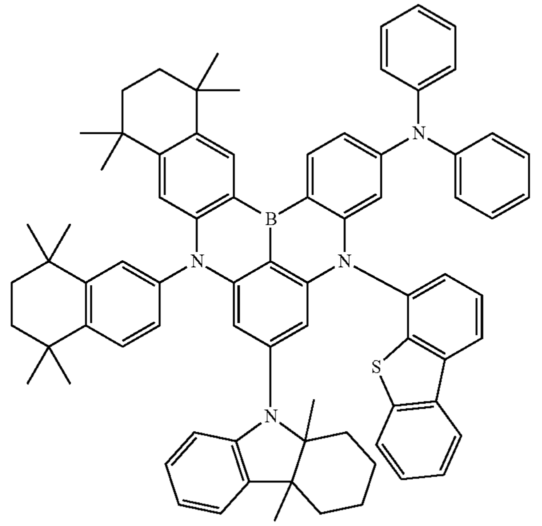
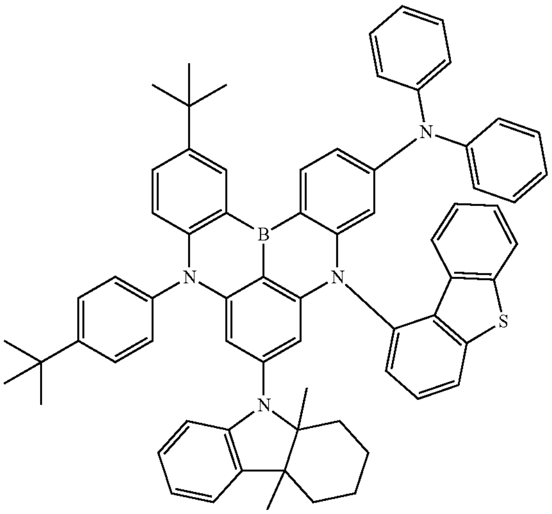
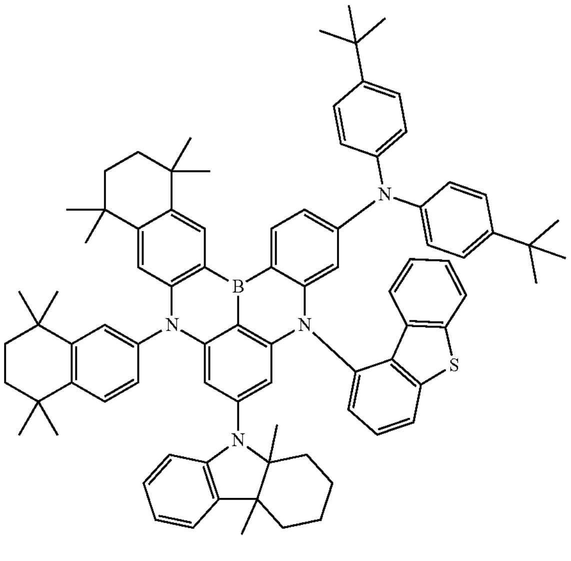
-continued
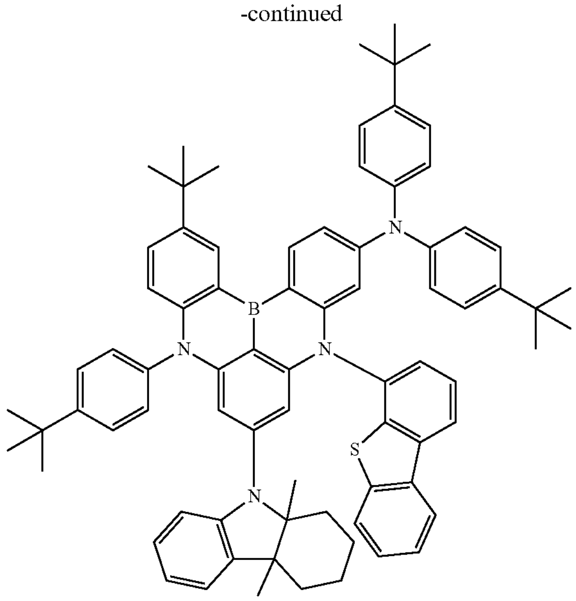
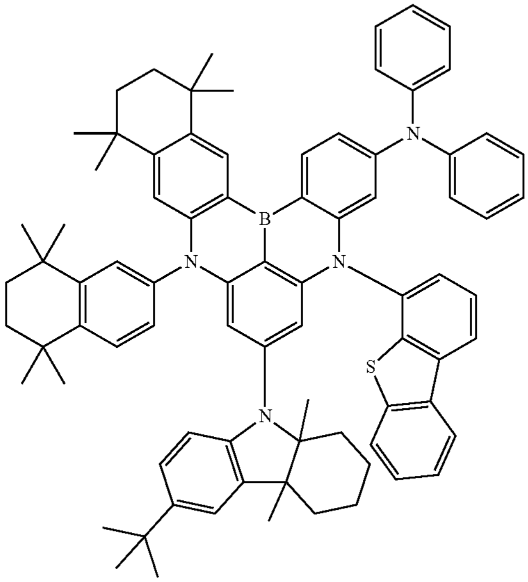
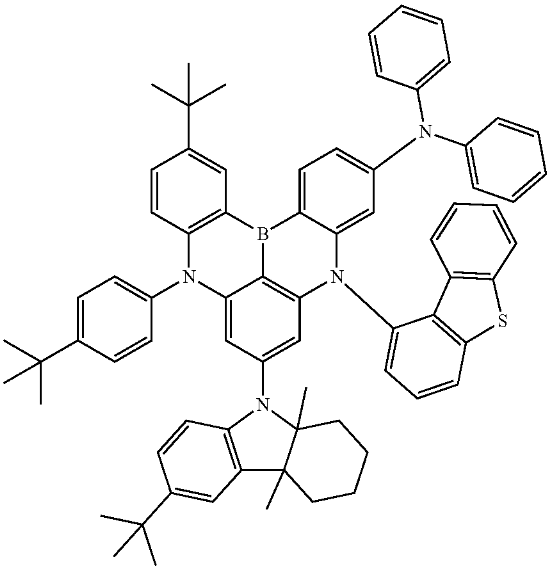

-continued
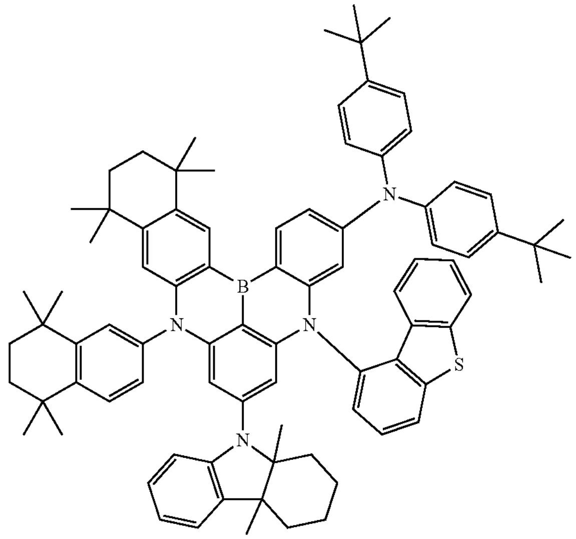
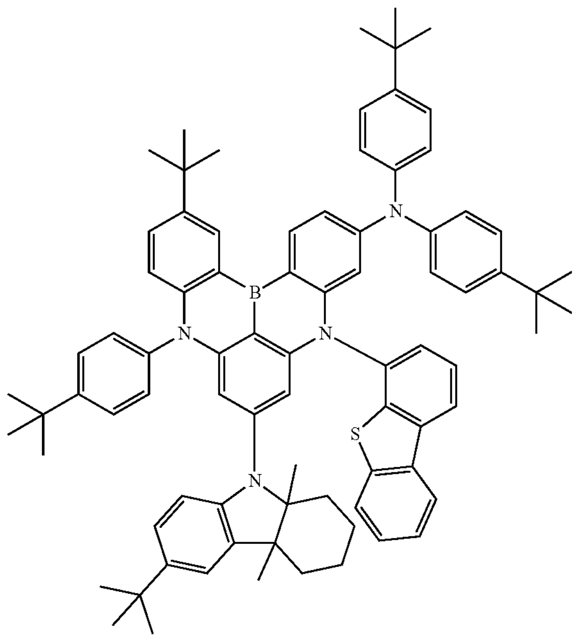
-continued
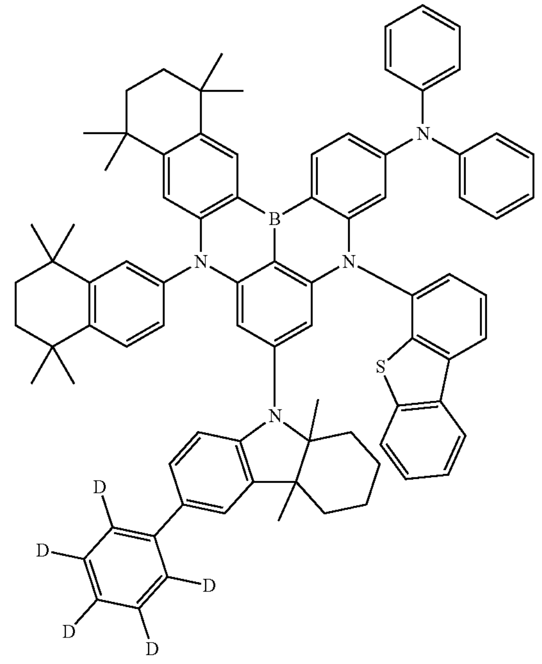
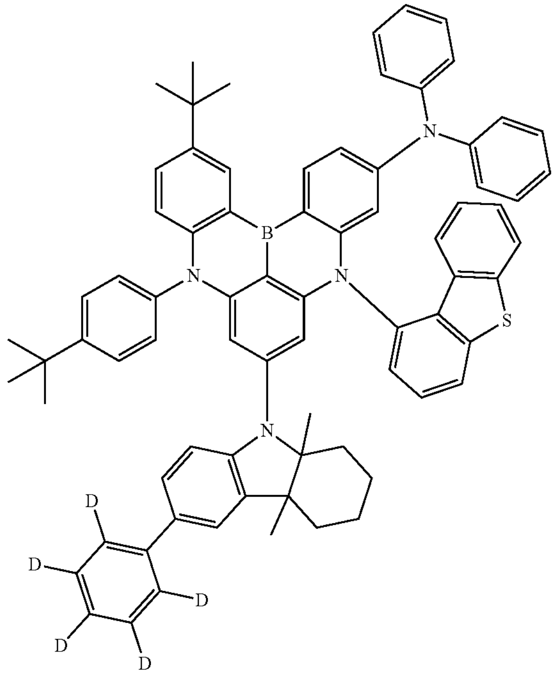

-continued
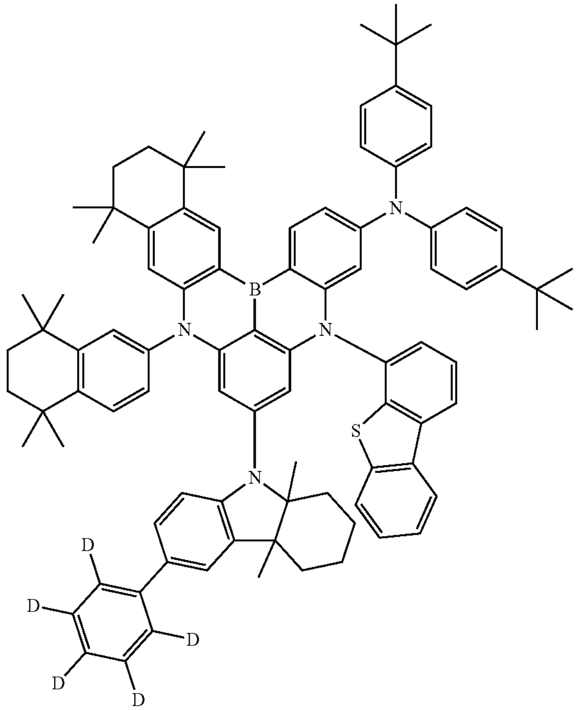
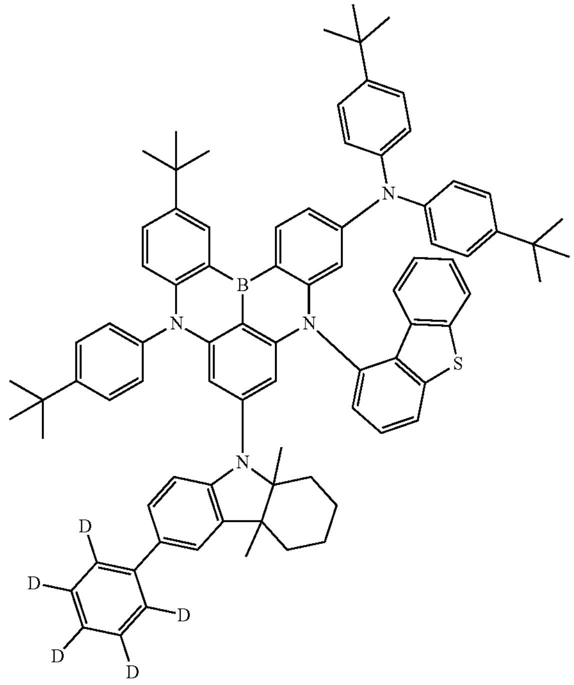
-continued
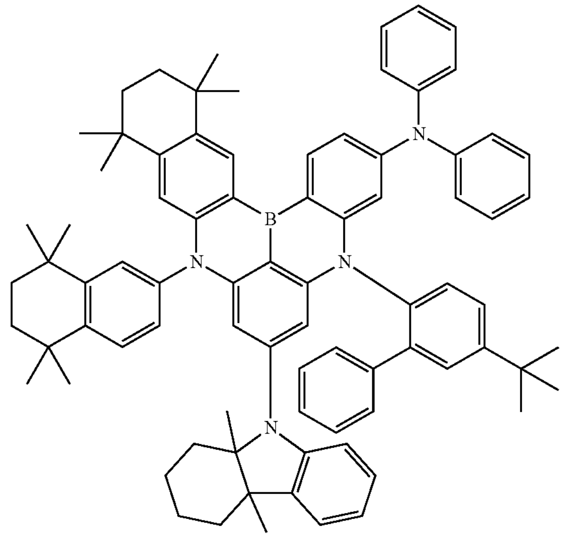
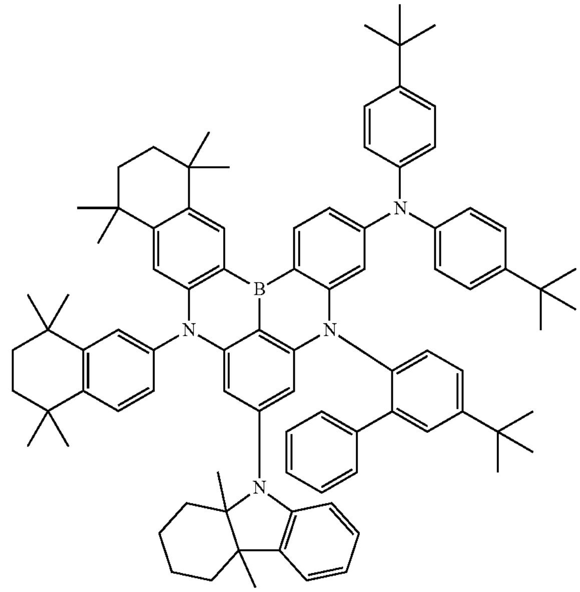
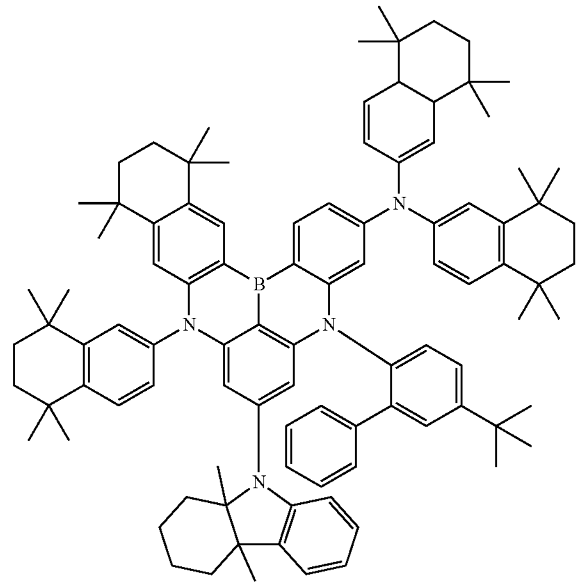

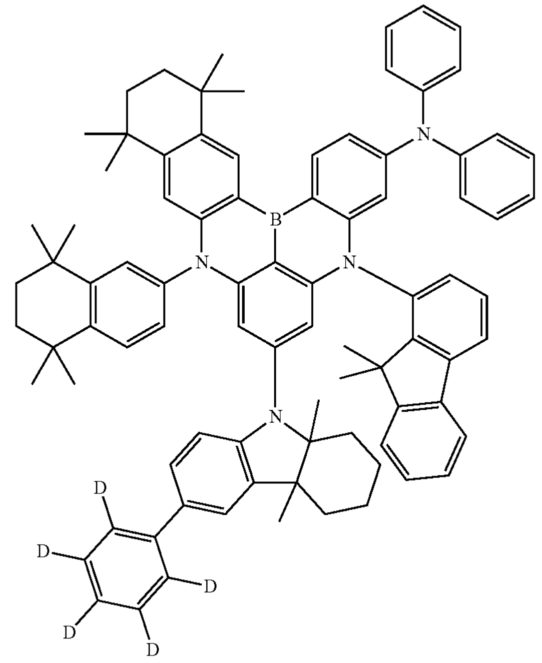
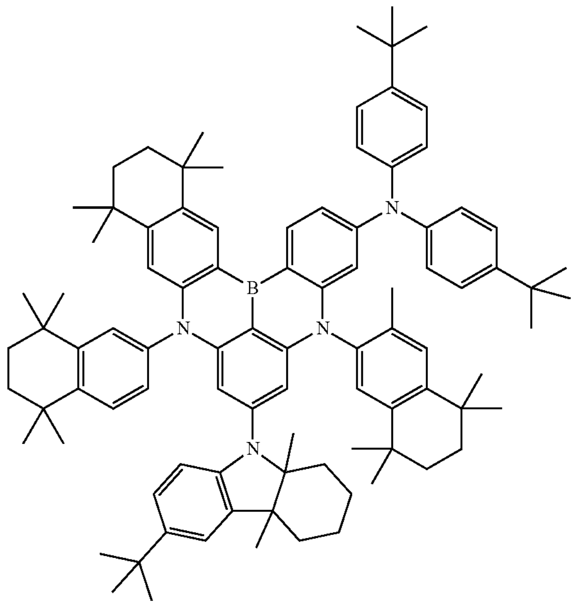
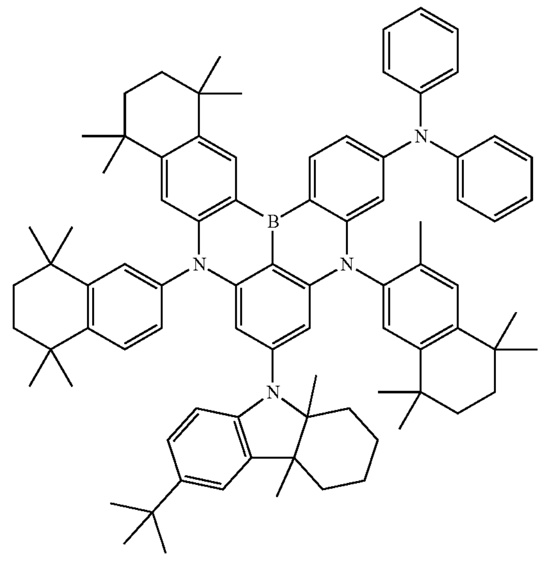
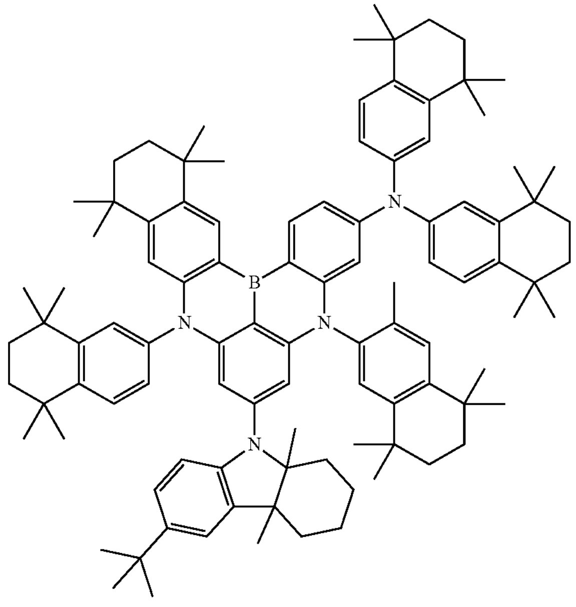

-continued
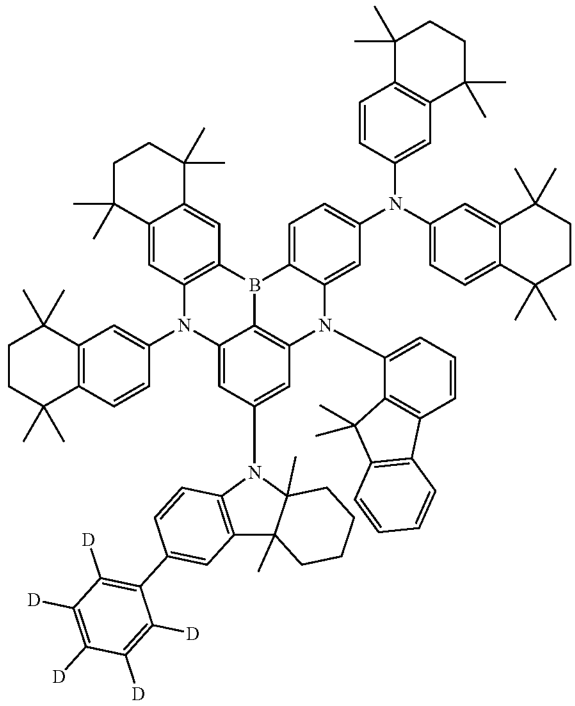
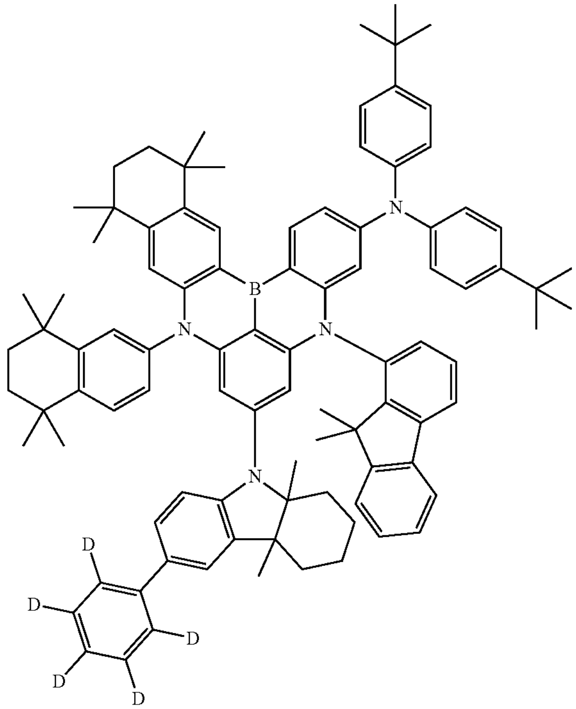
-continued
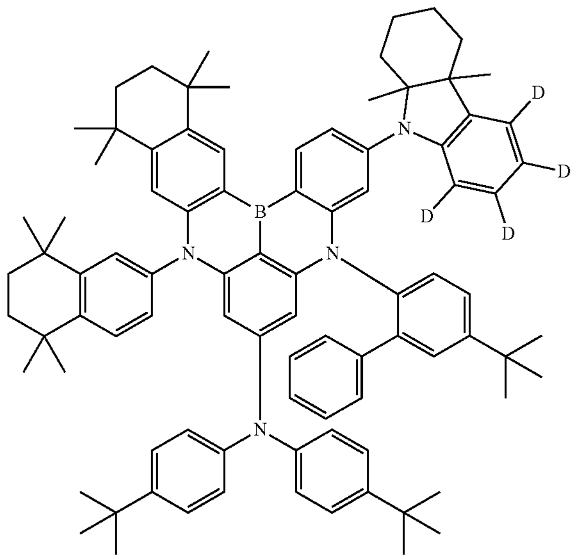
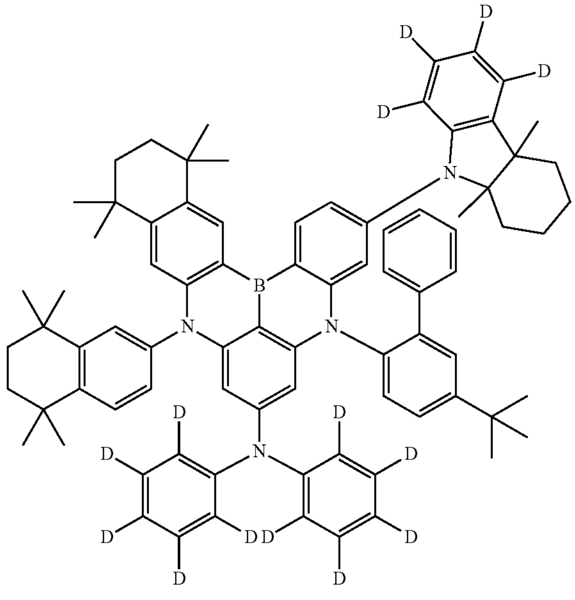
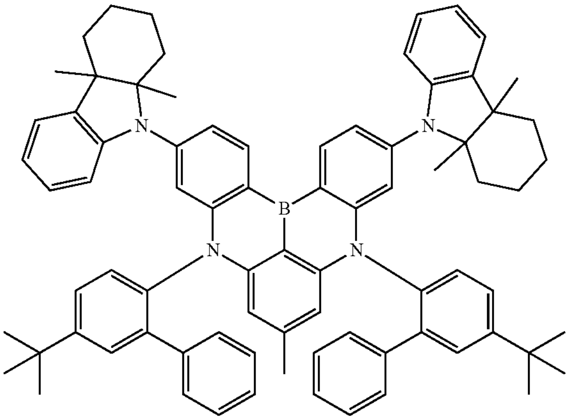

-continued
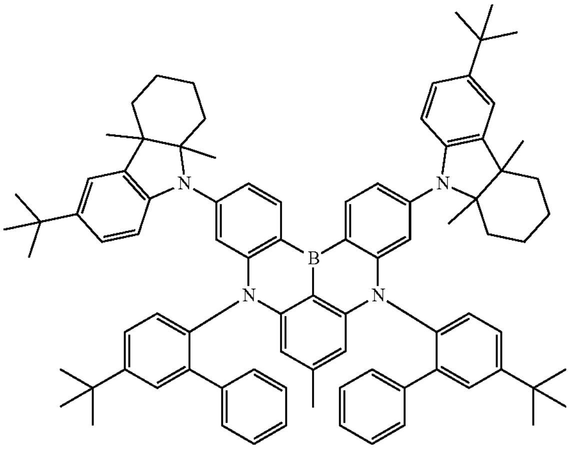
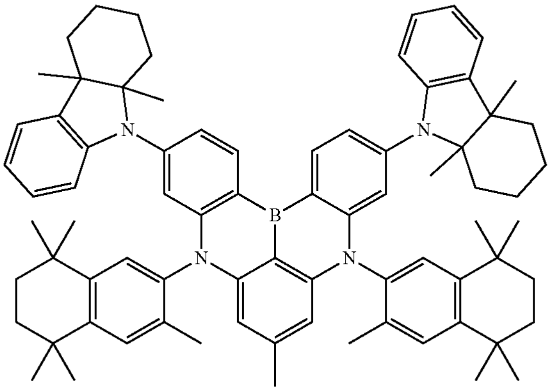
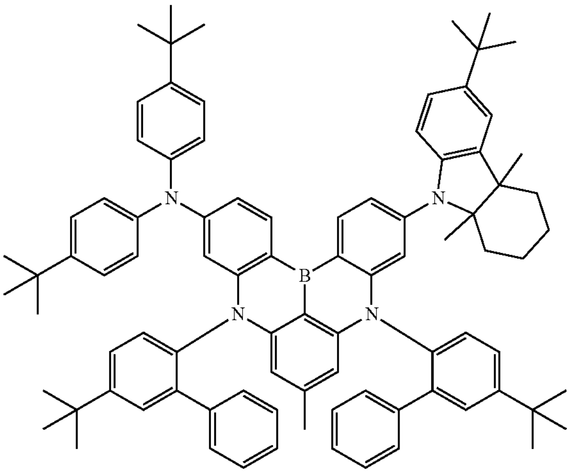
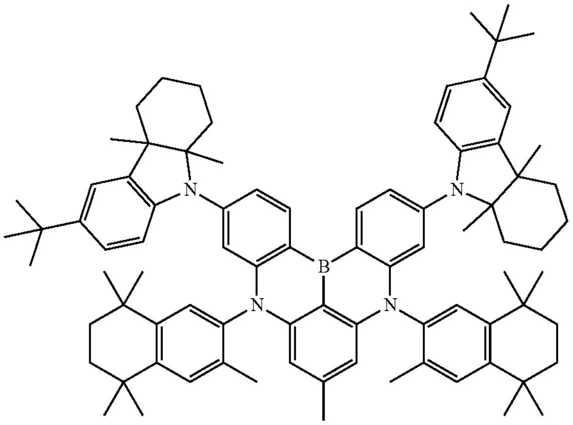
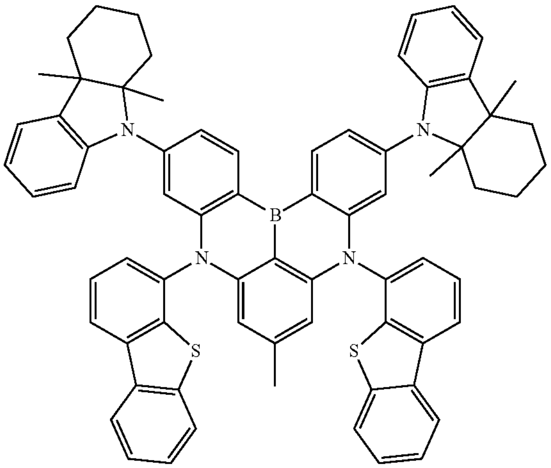
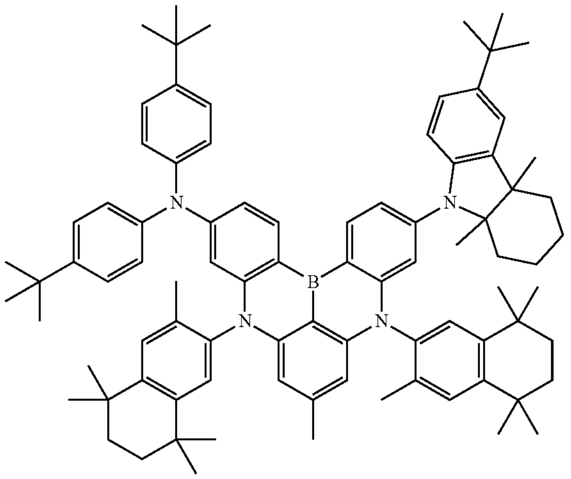
-continued

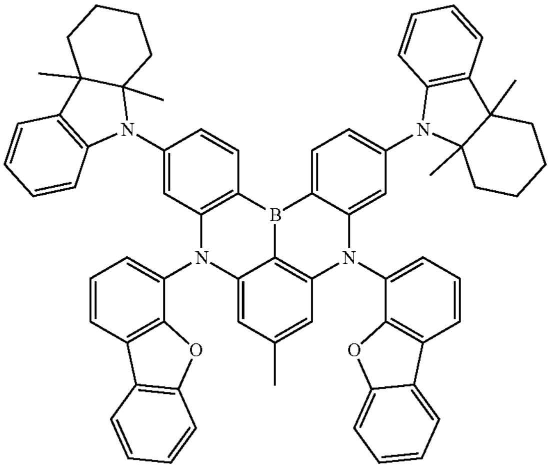
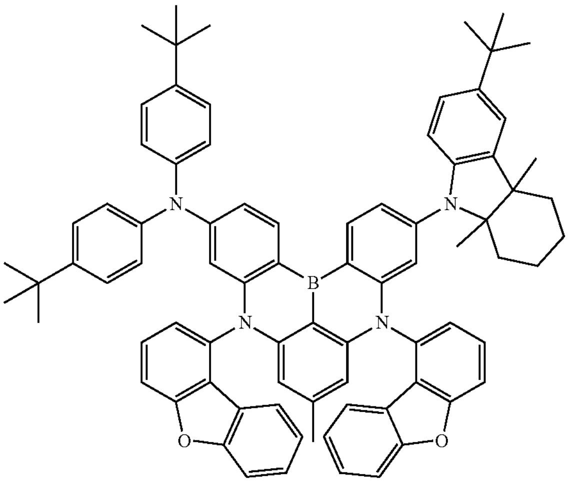
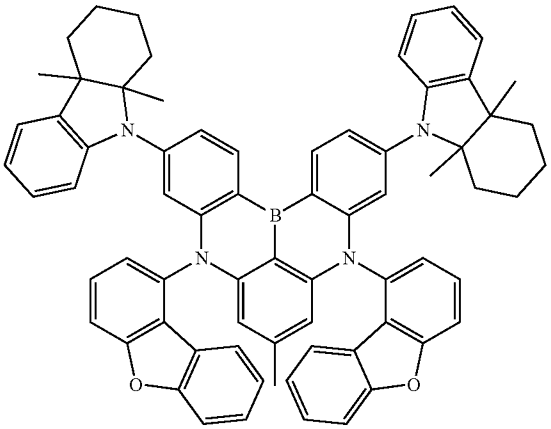
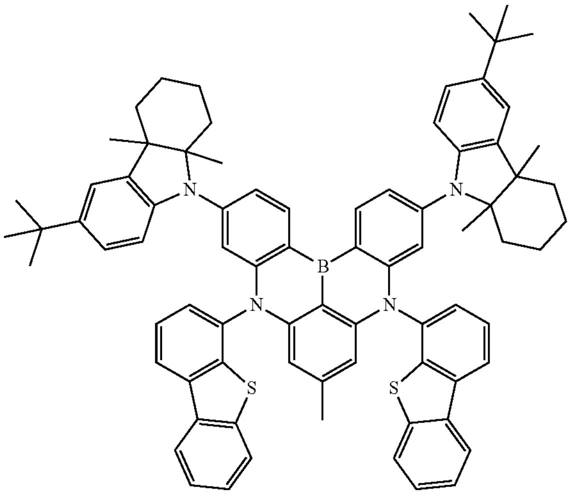
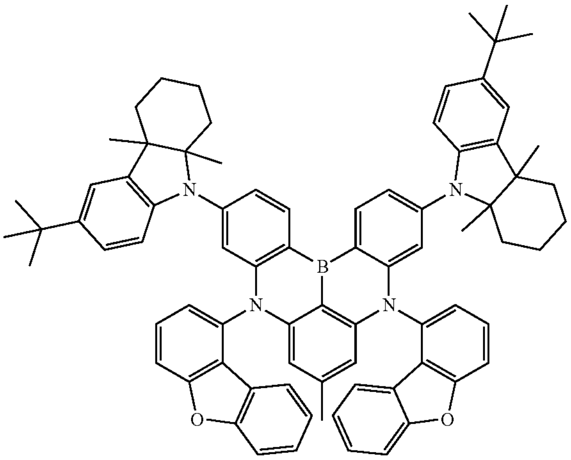
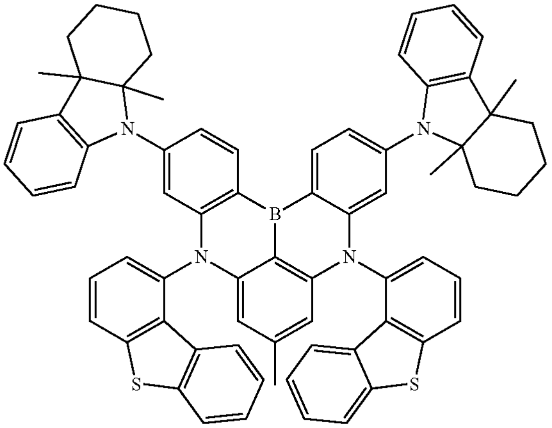

-continued
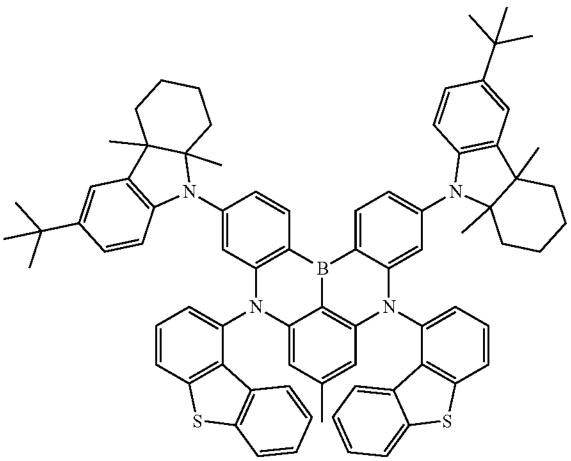
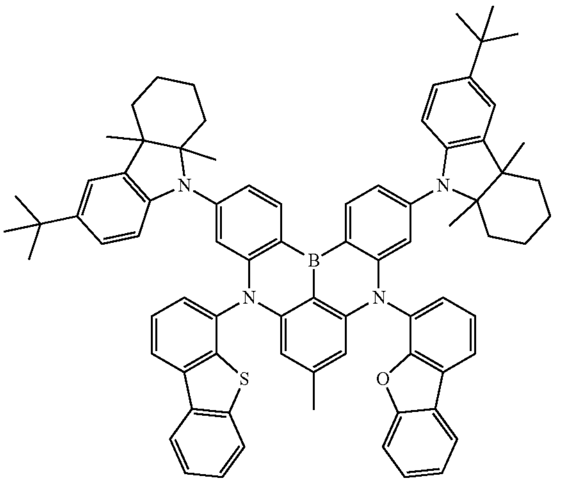
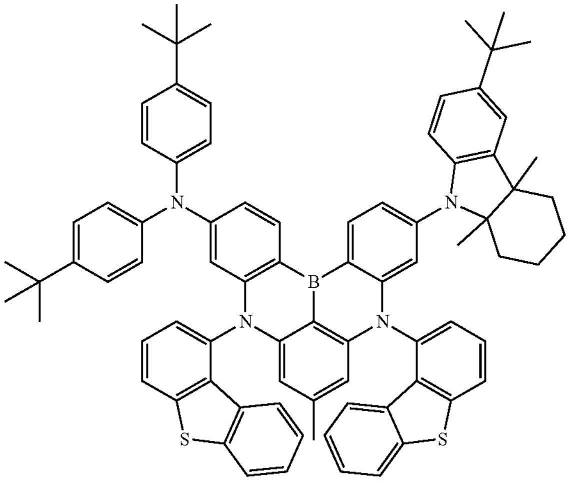
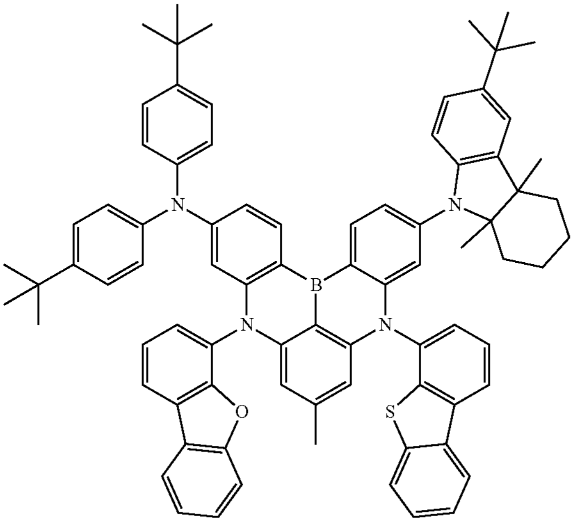
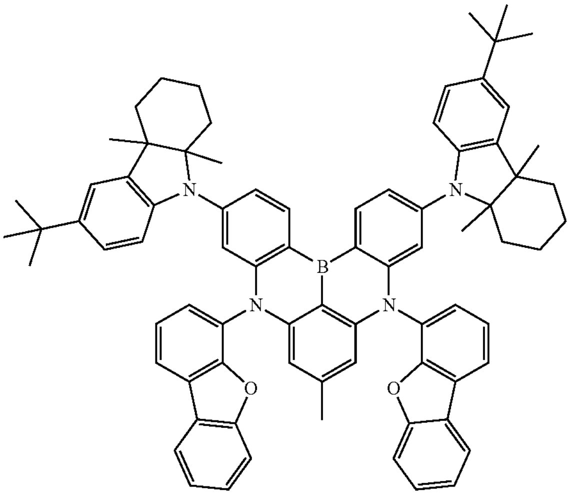
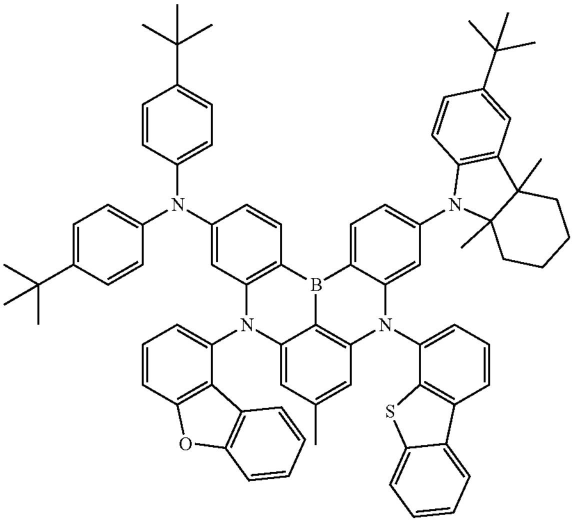

-continued
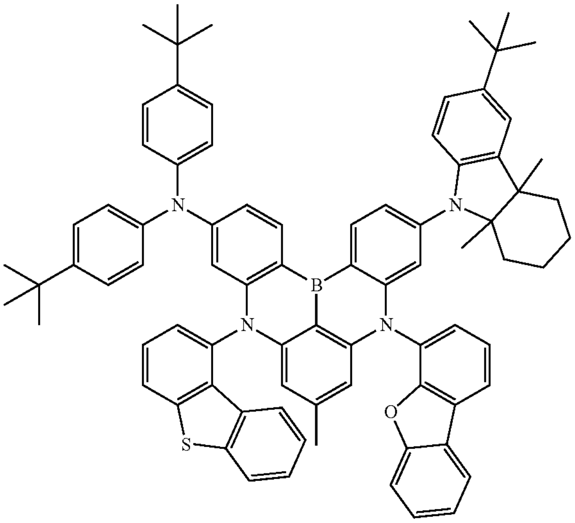
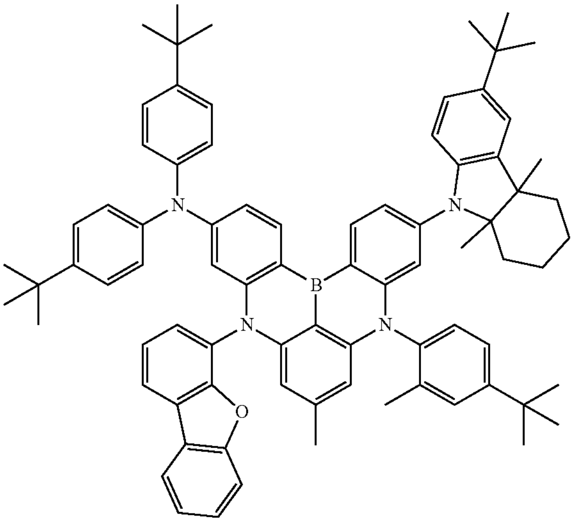
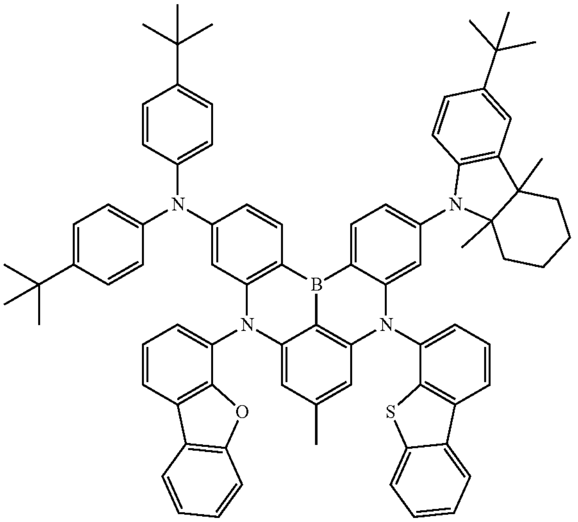
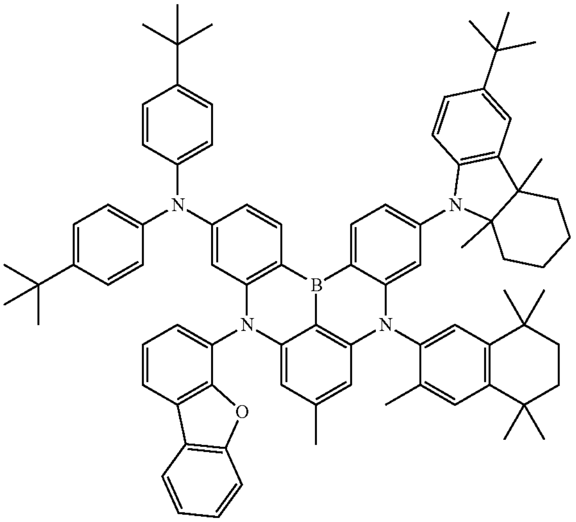
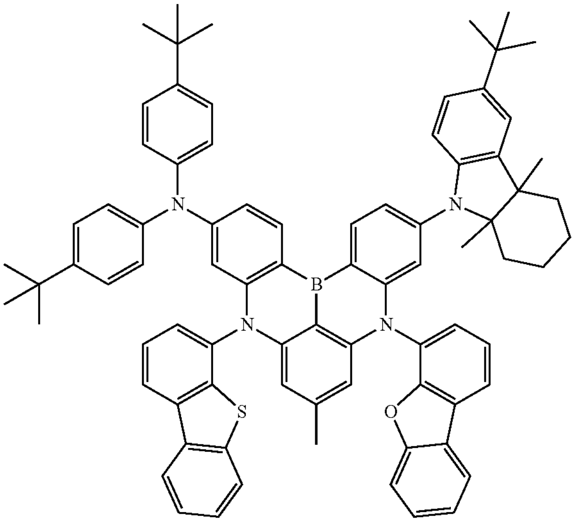
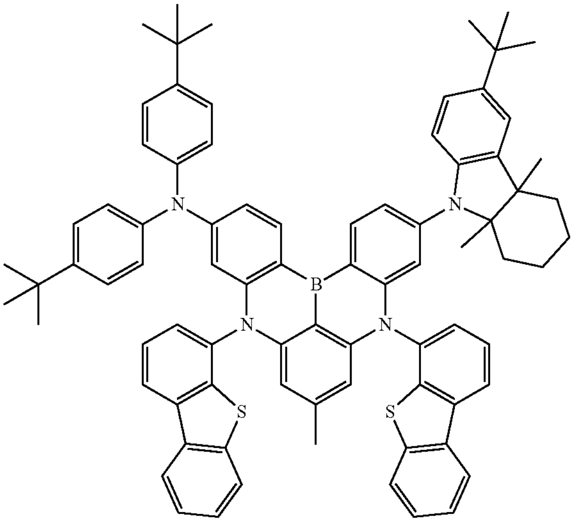 [SMILES: Cc1cc2c3c(c1)N(c1cccc4c1oc1ccccc14)c1cc(N4c5ccc(C(C)(C)C)cc5C5(C)CCCCC45C)ccc1B3c1ccc(N(c3ccc(C(C)(C)C)cc3)c3ccc(C(C)(C)C)cc3)cc1N2c1cccc2c1oc1ccccc12]
-continued -continued
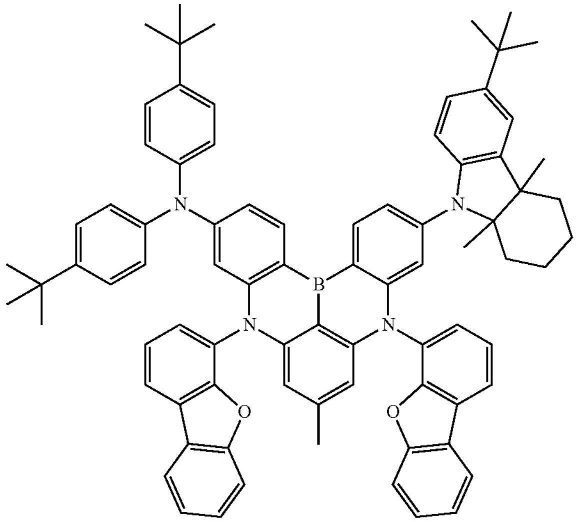
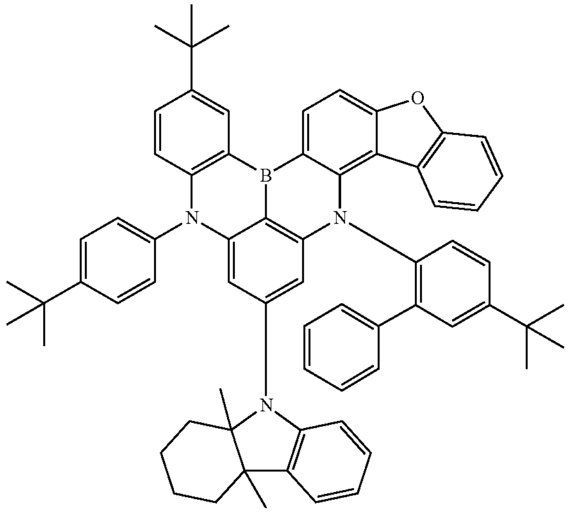
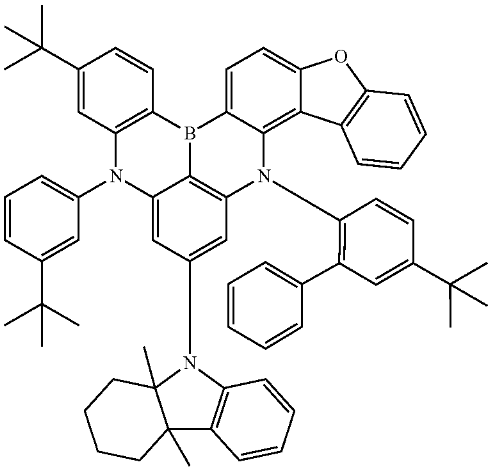
-continued
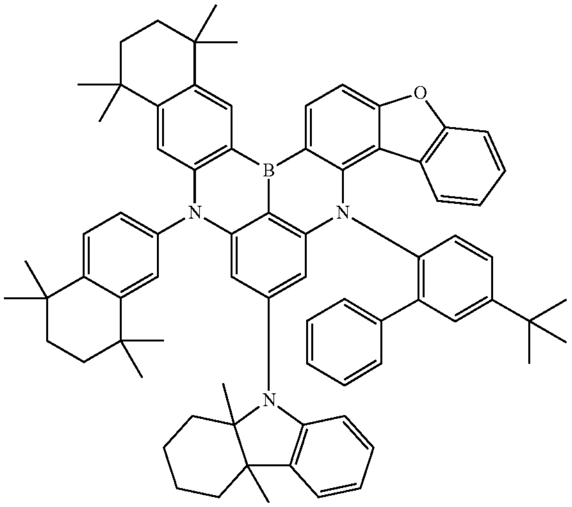
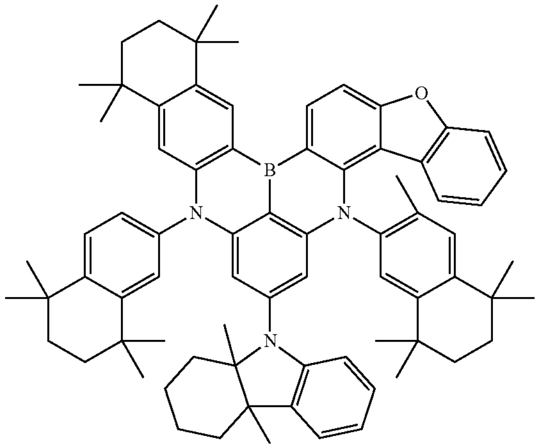
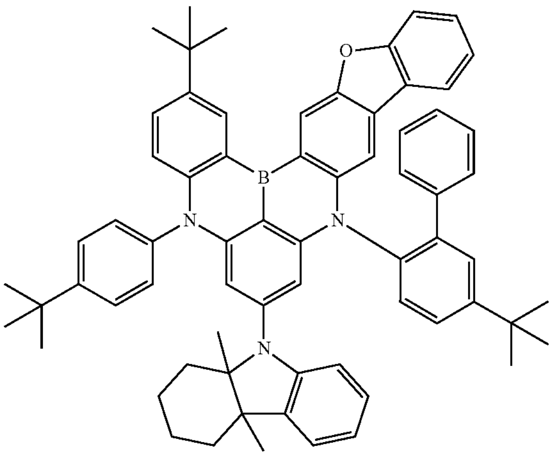

-continued
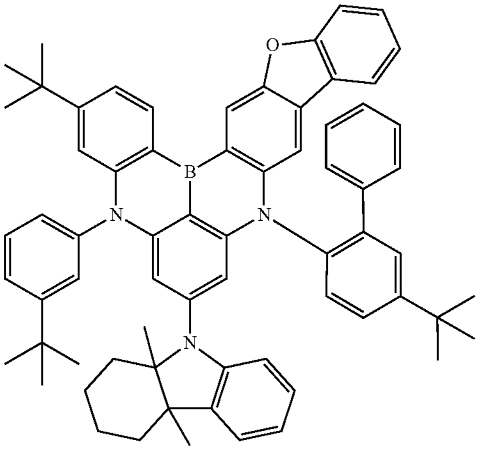
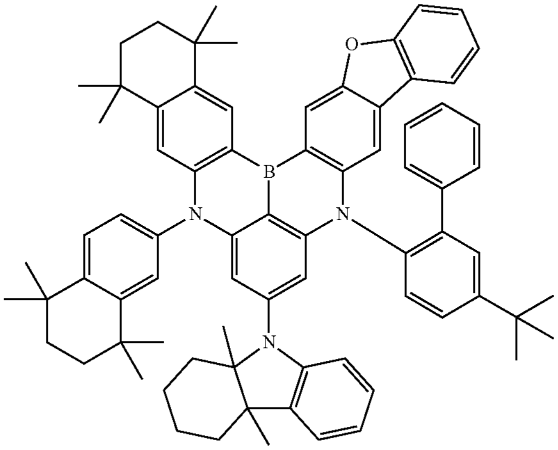
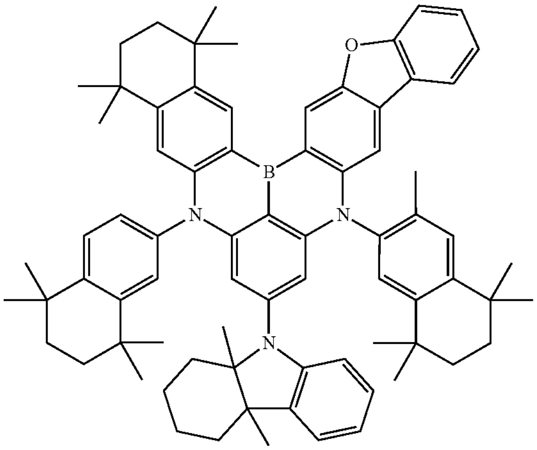
-continued
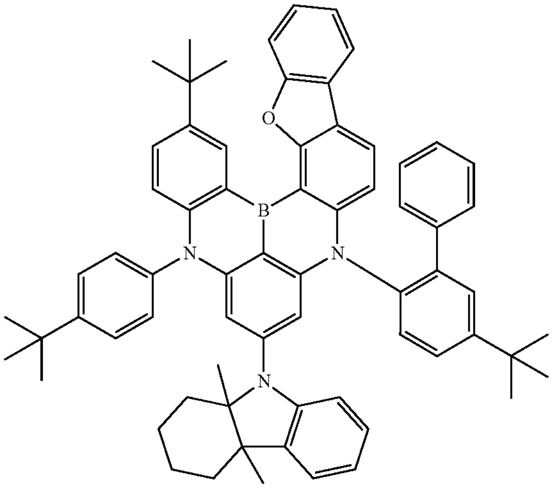
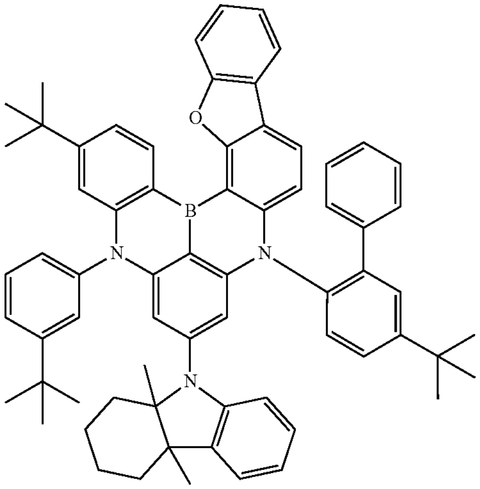
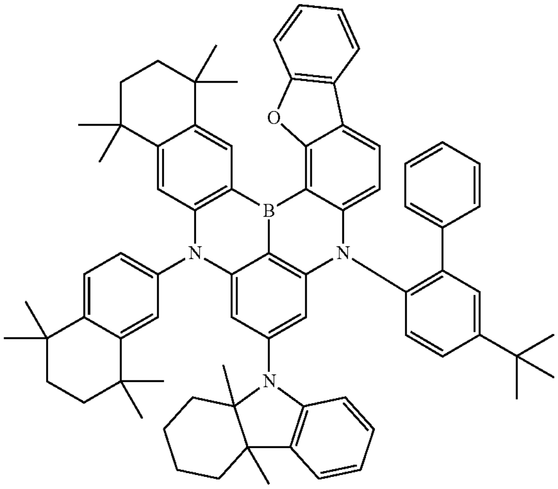

-continued
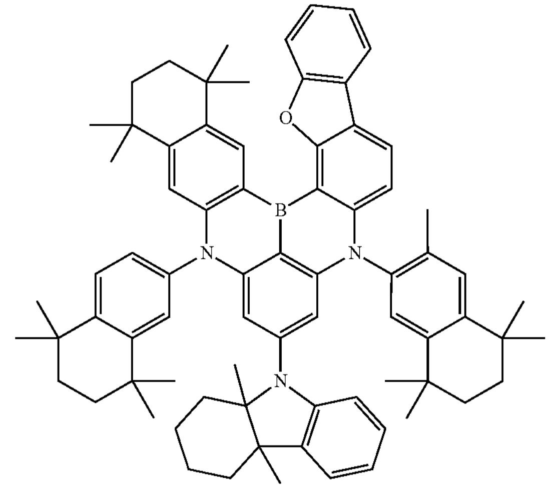
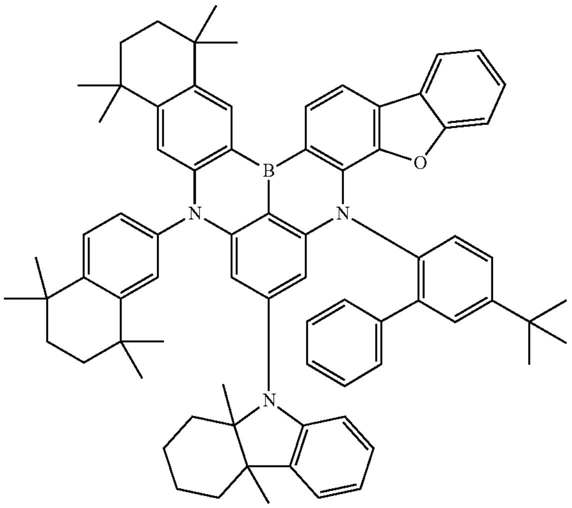
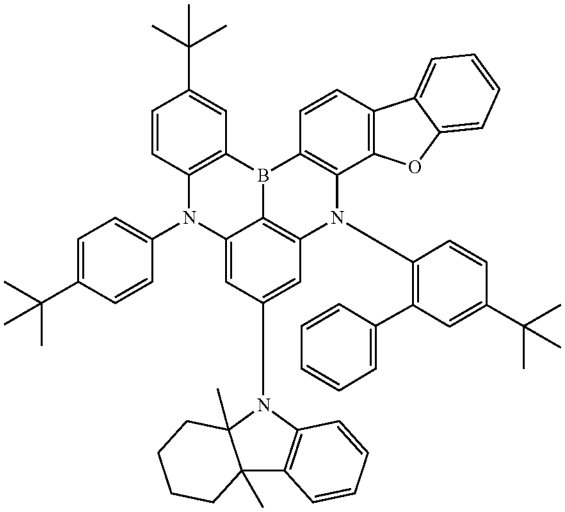
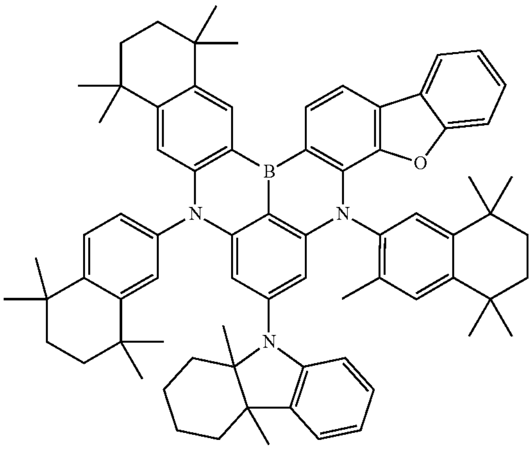
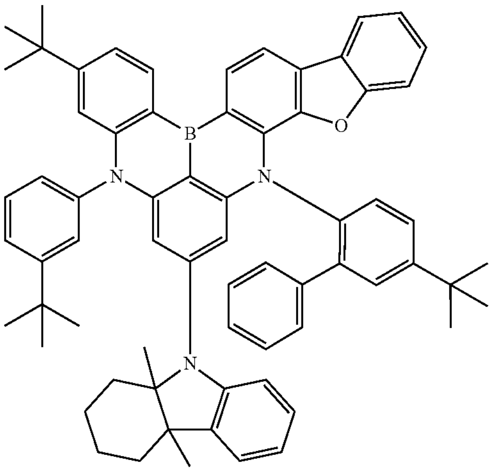
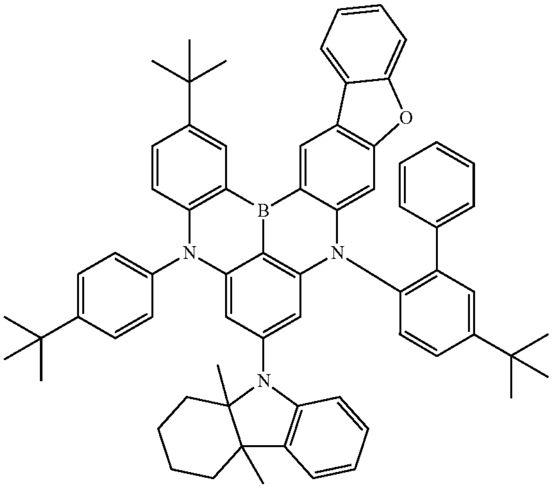
-continued -continued
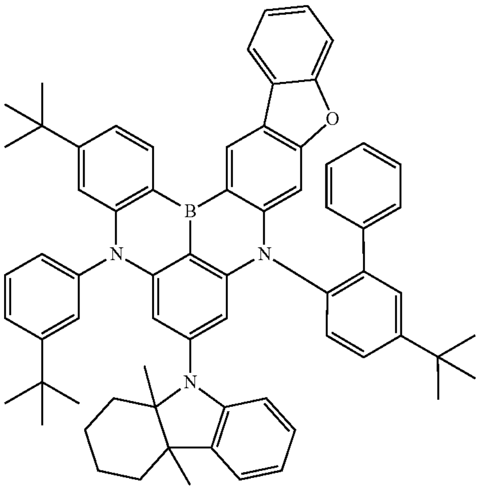
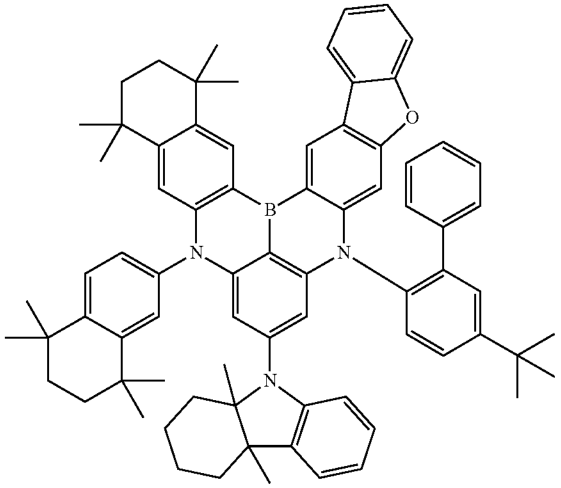
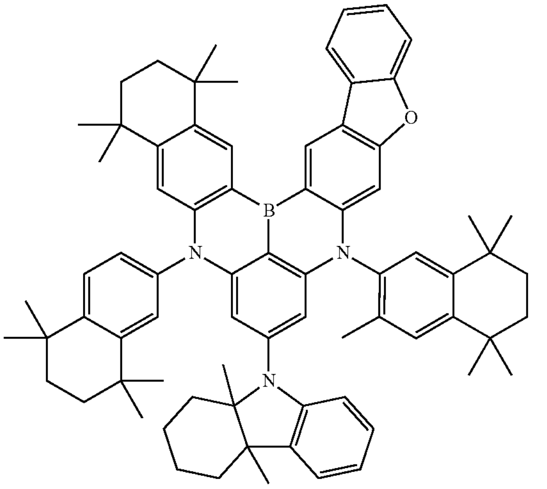
-continued
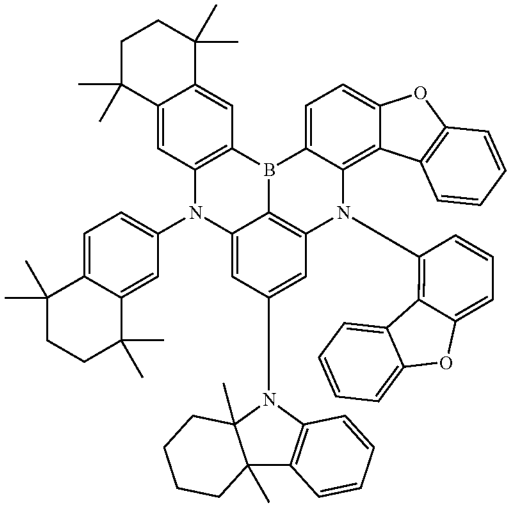
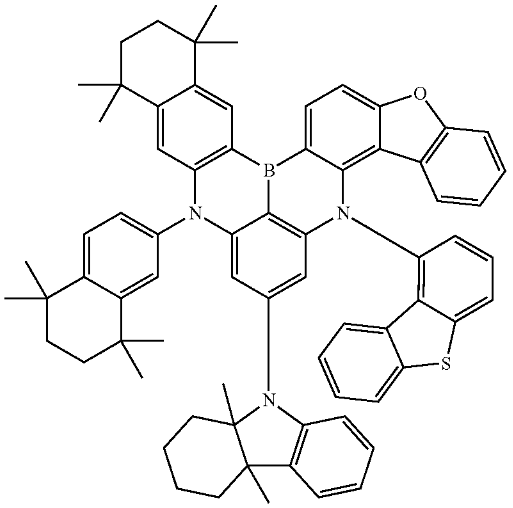
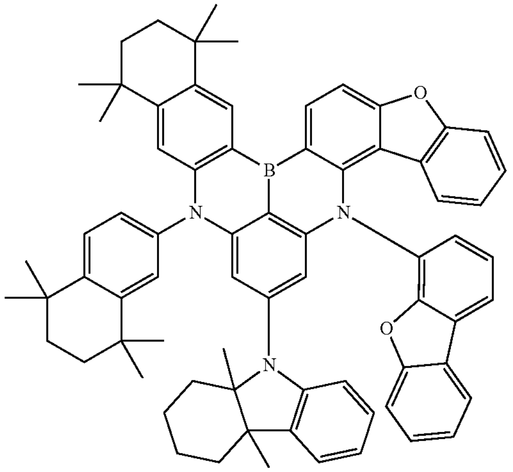

-continued
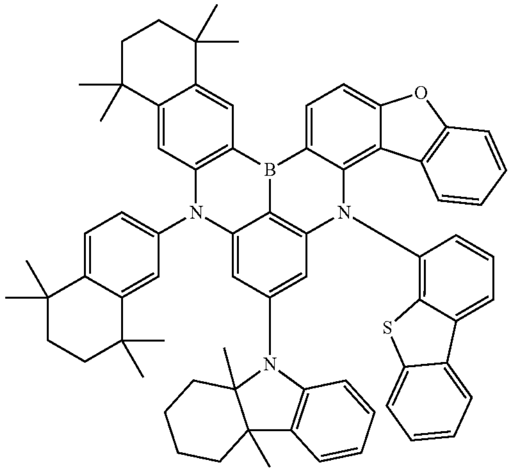
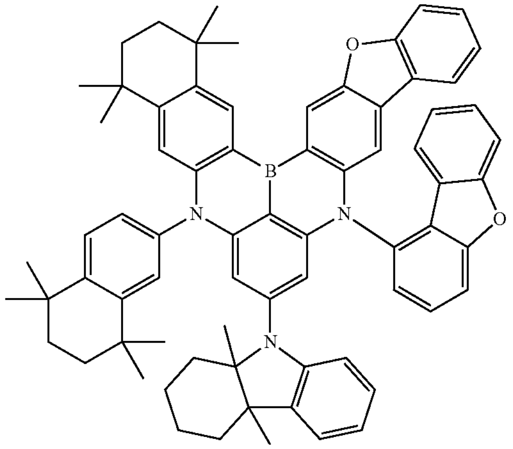
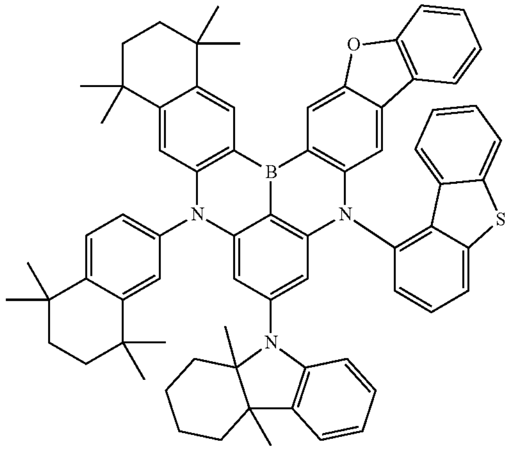
-continued
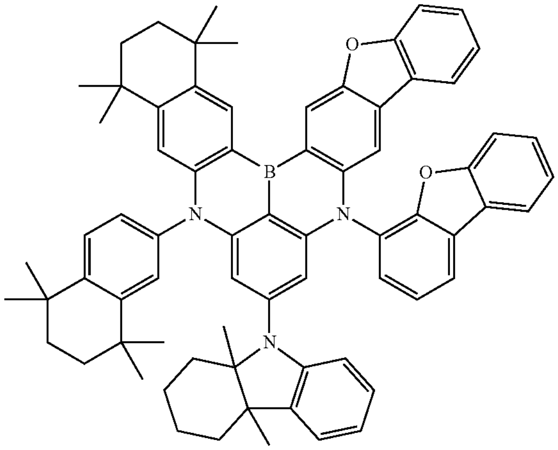
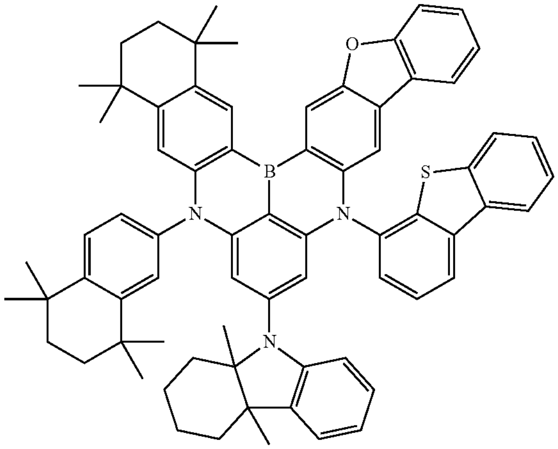
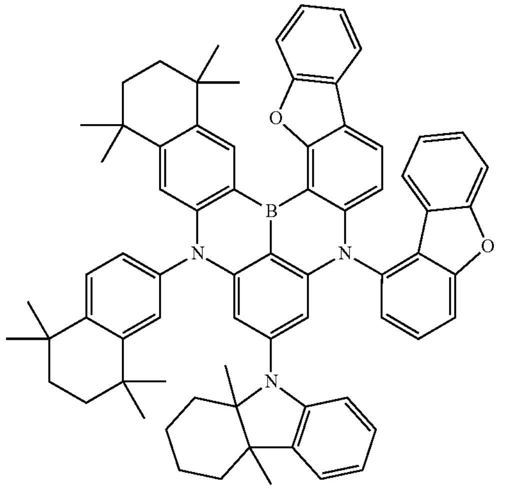

-continued
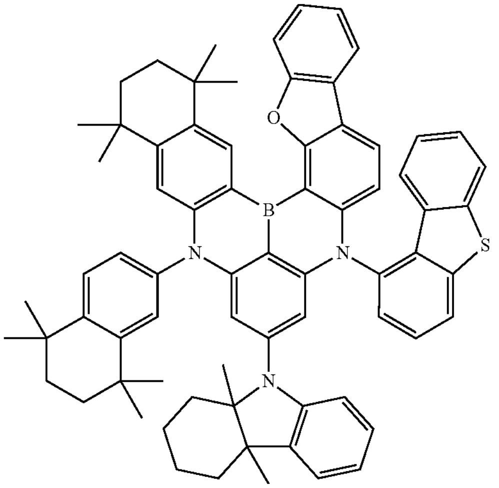
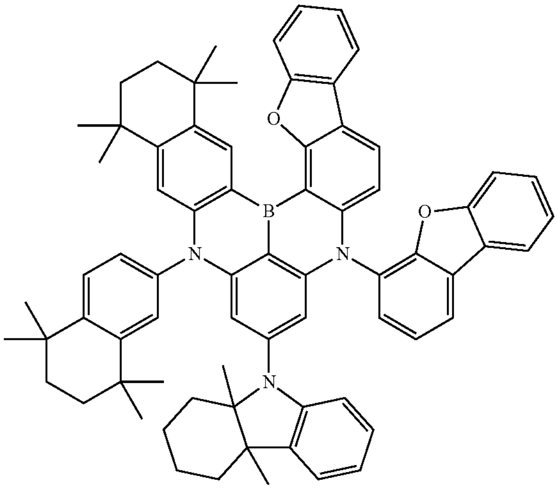
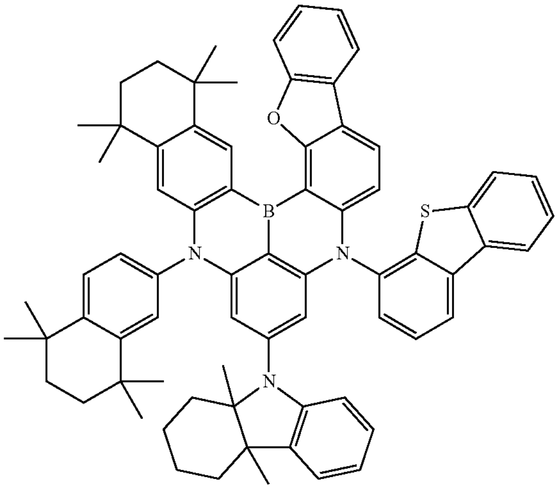
-continued
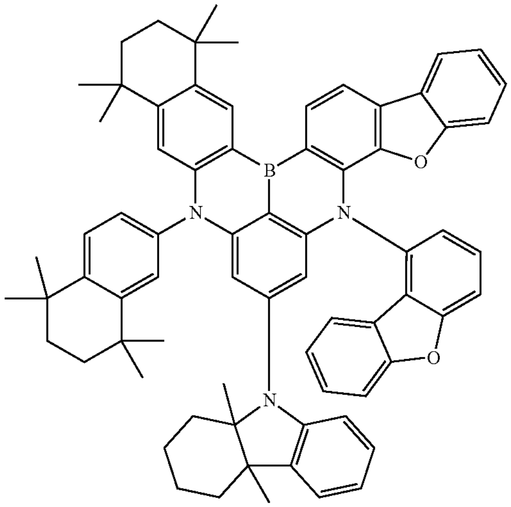
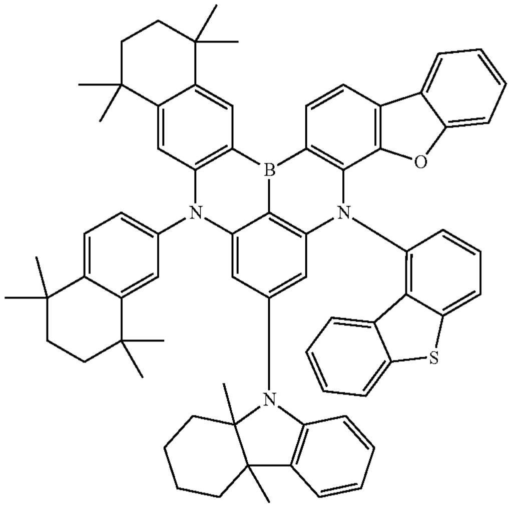
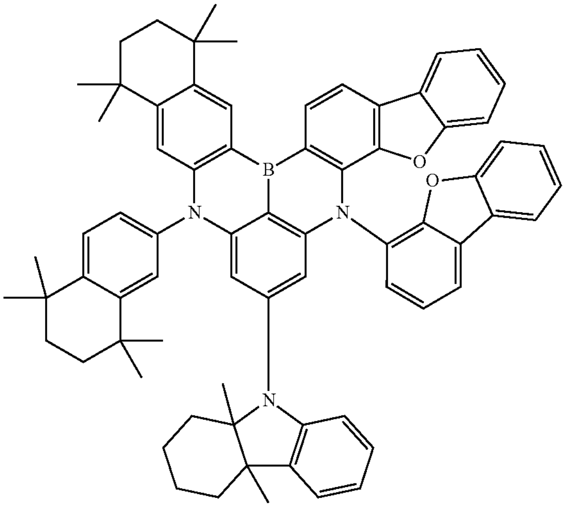

-continued
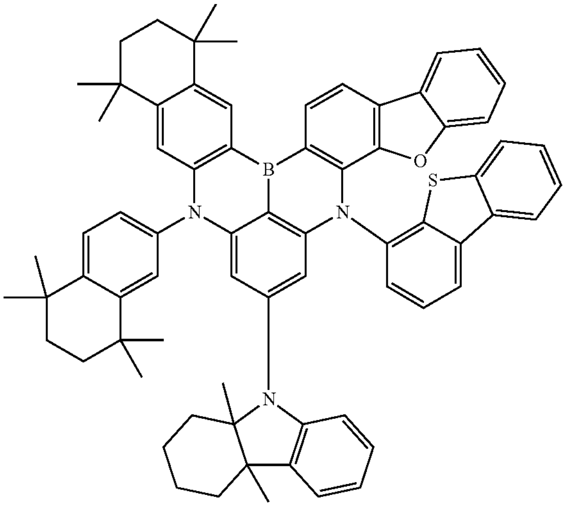
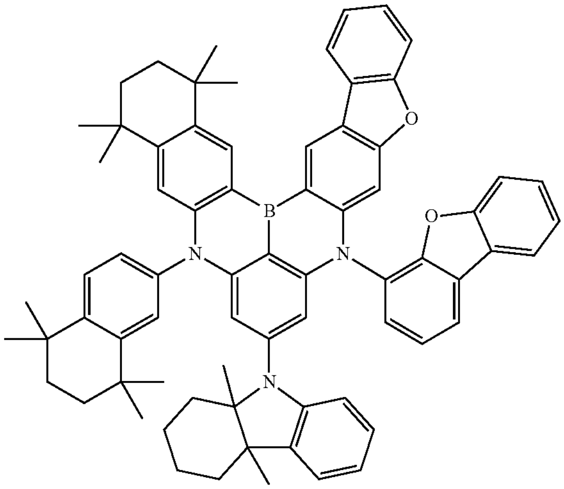
-continued
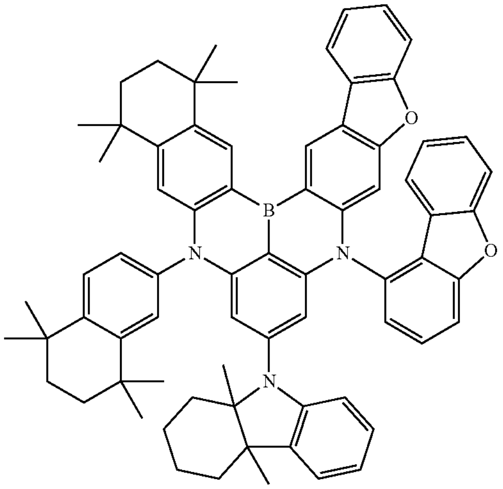
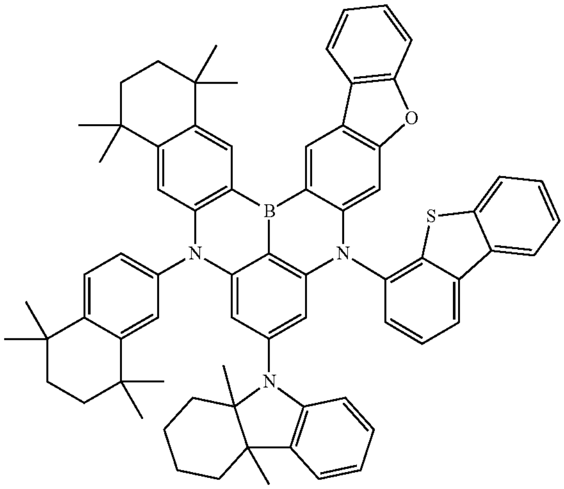
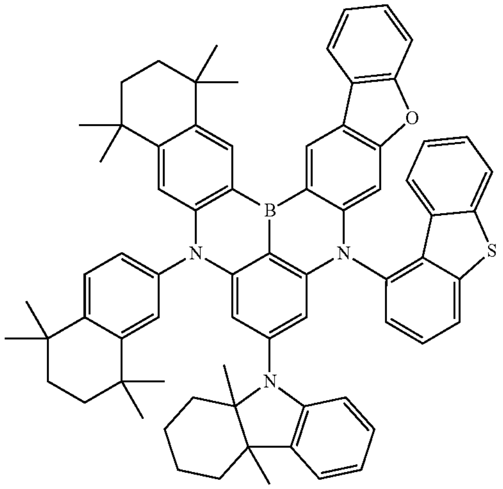
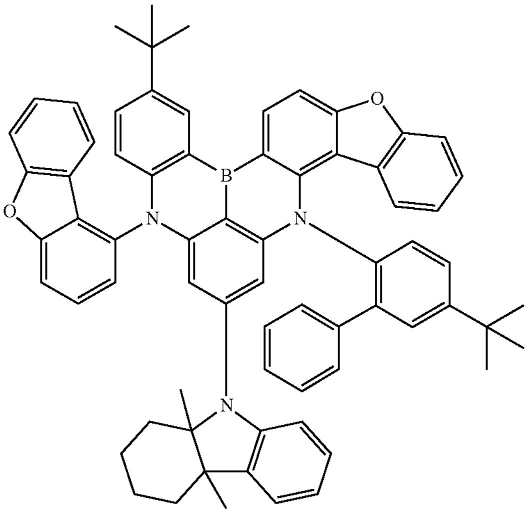

-continued
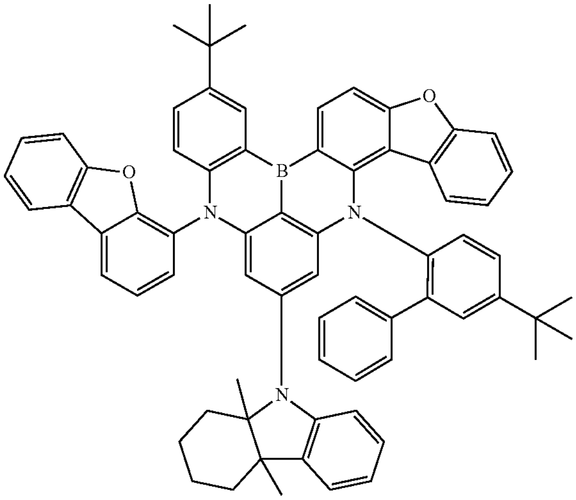
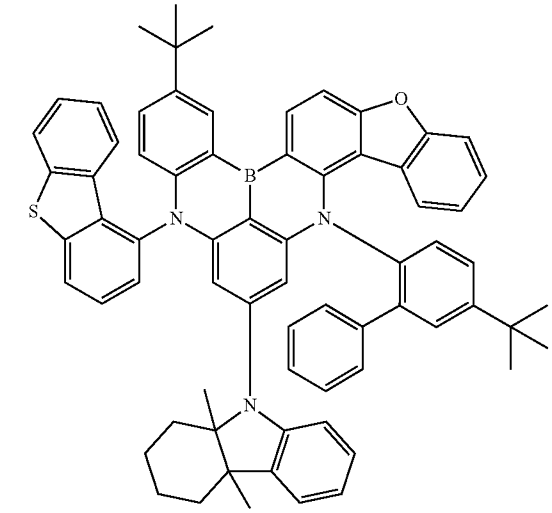
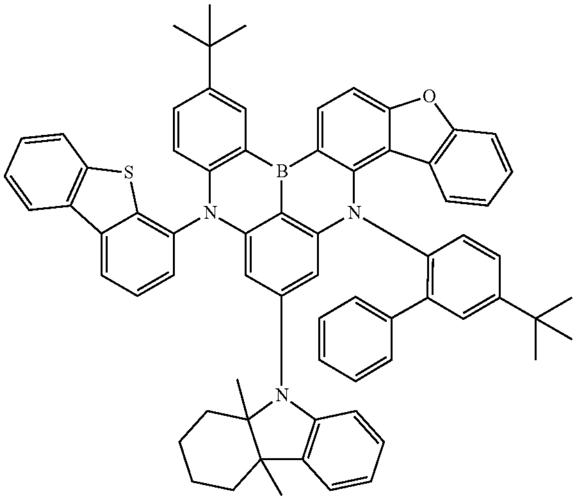
-continued
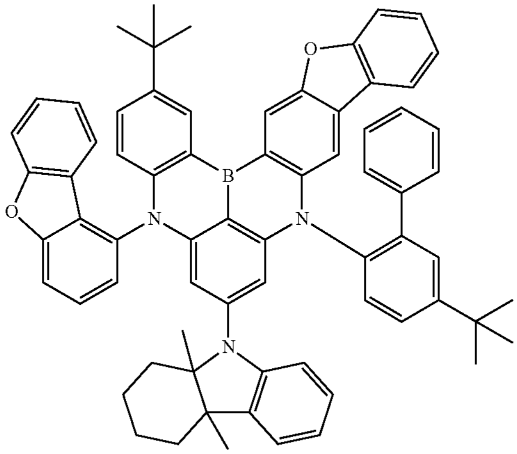
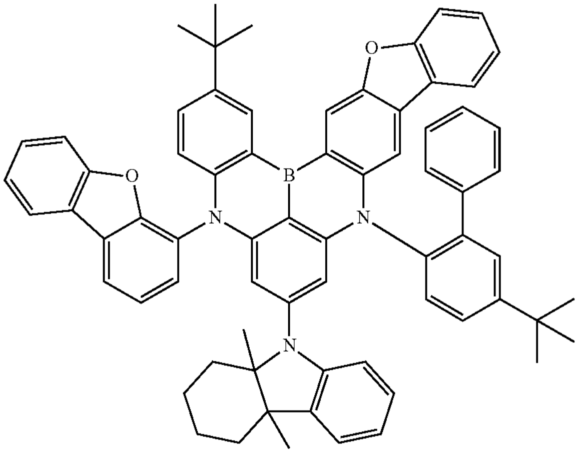
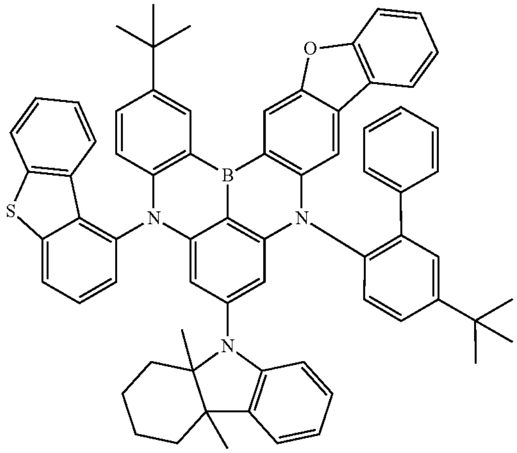

-continued
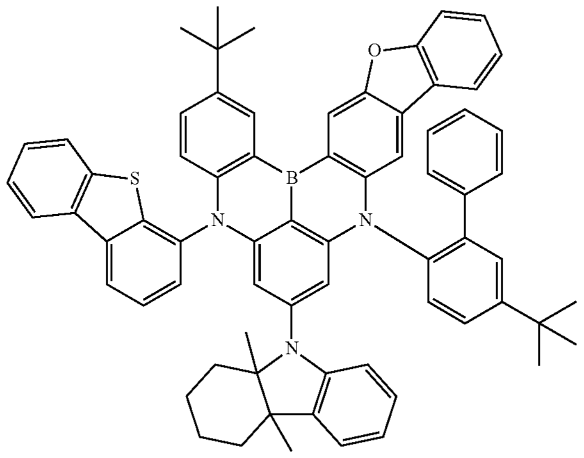
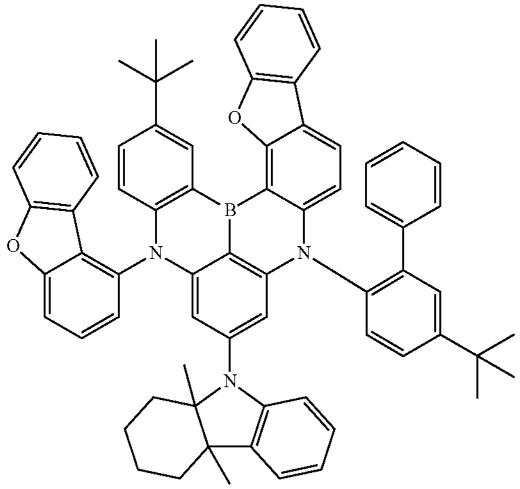
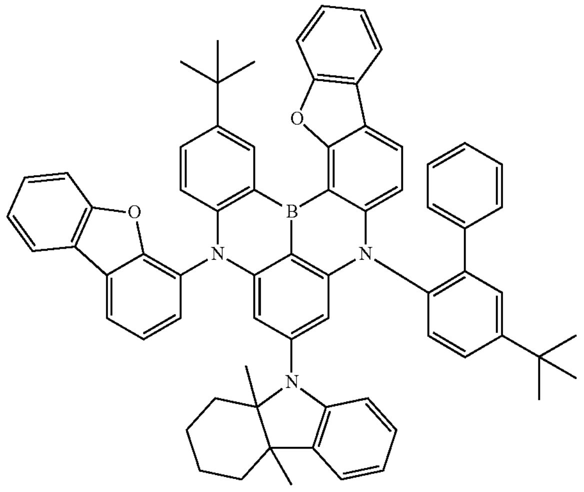
-continued
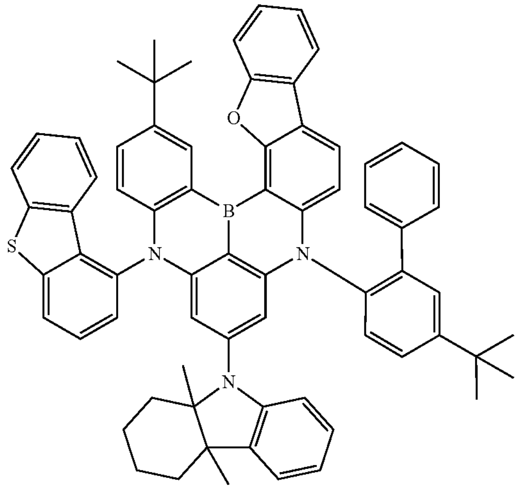
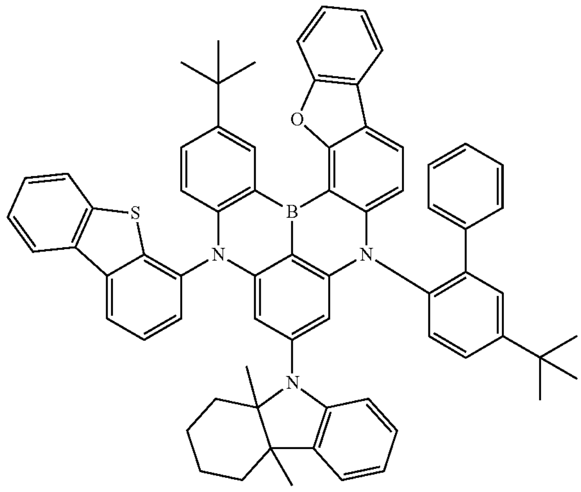
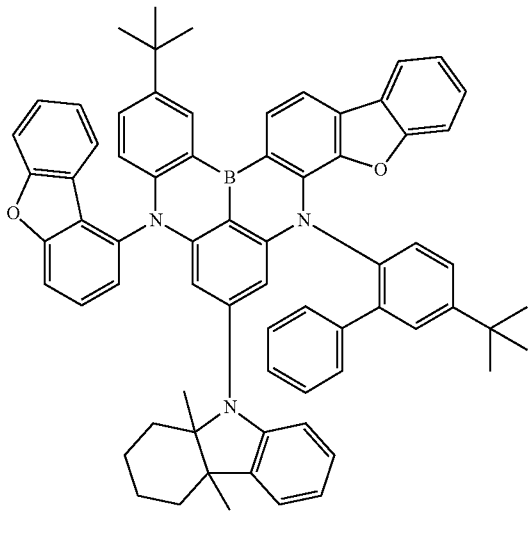

-continued
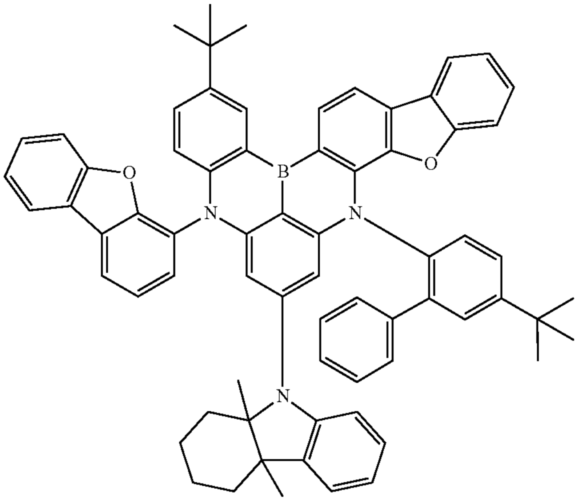
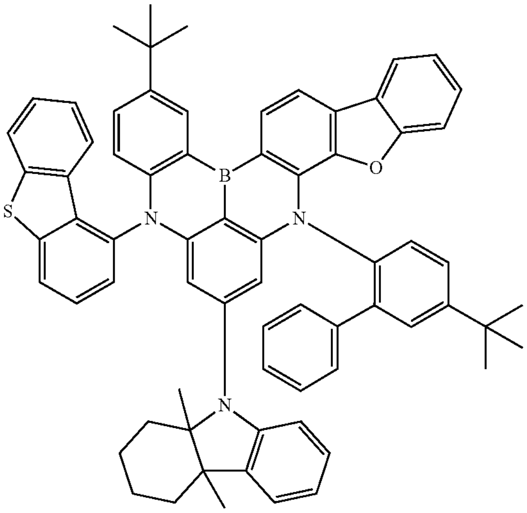
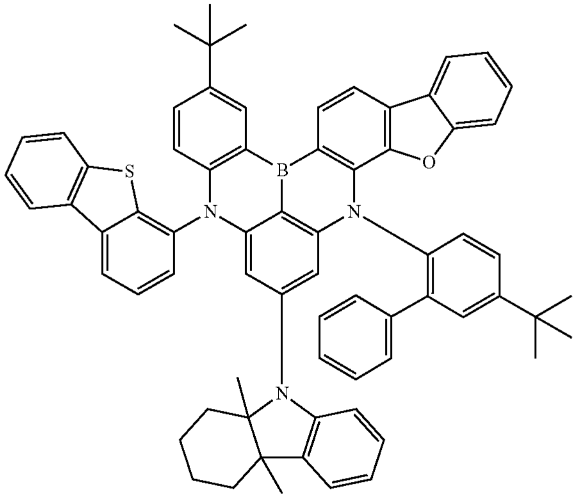
-continued
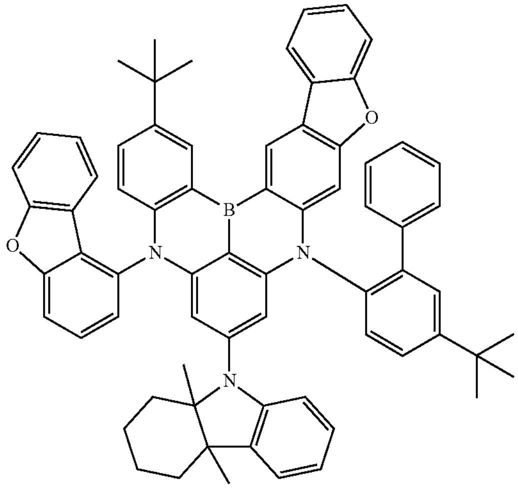
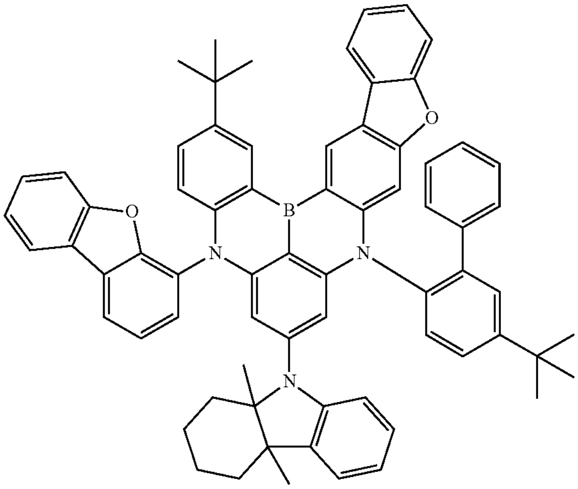
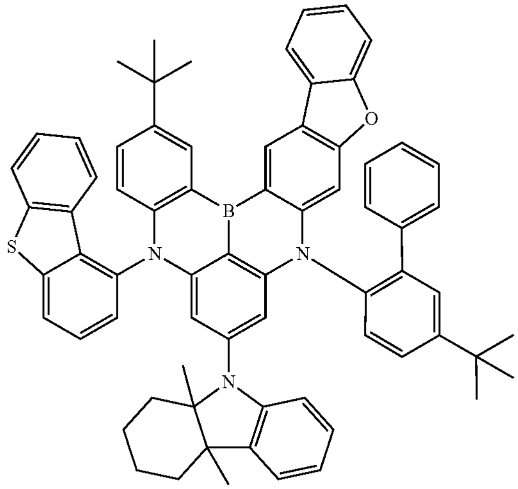

-continued
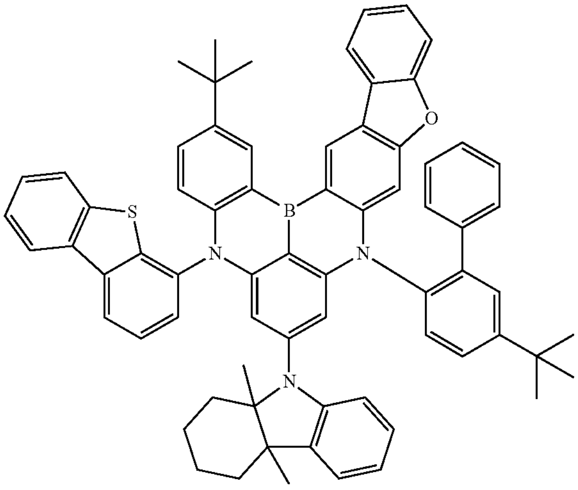
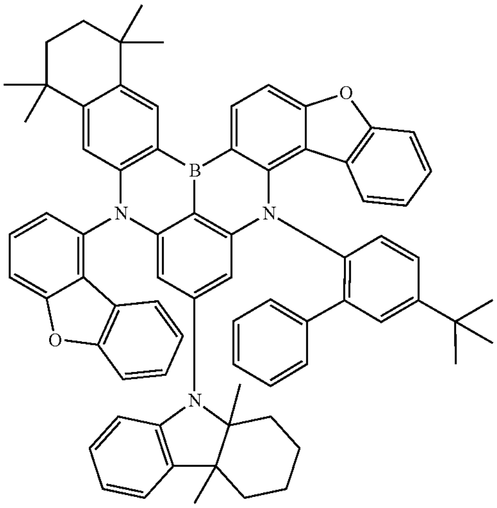
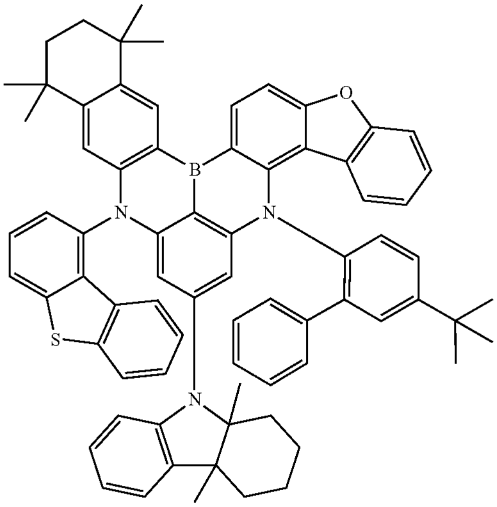
-continued
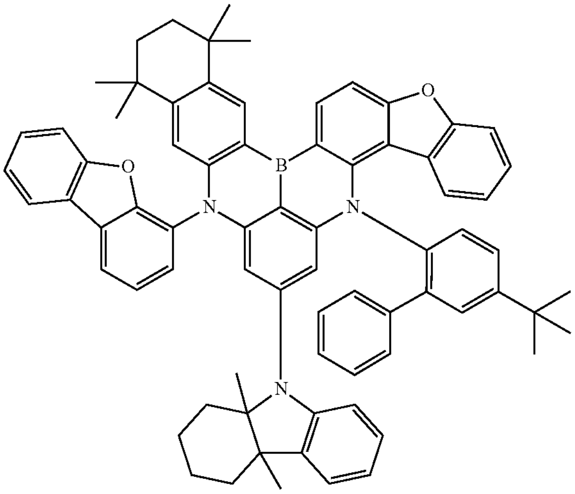
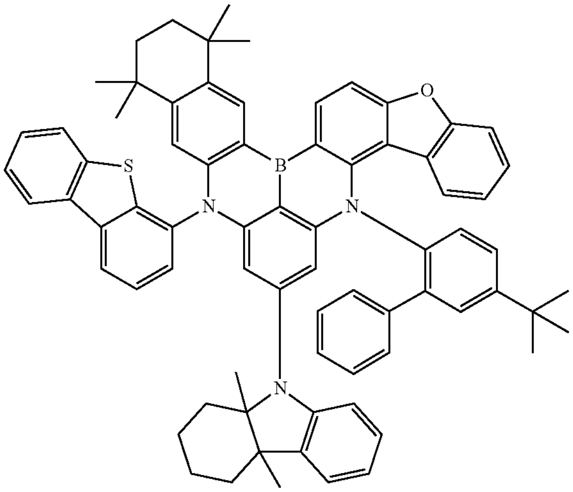
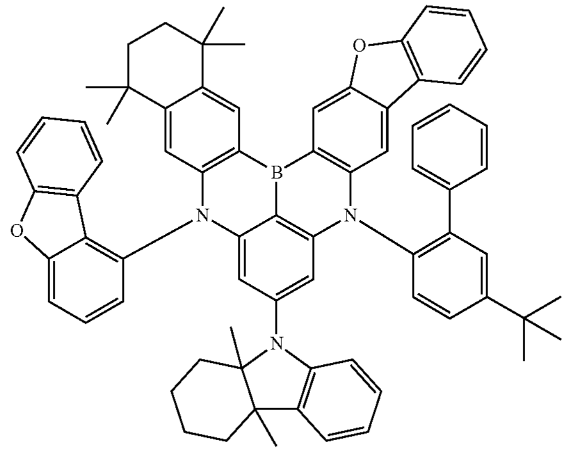

-continued
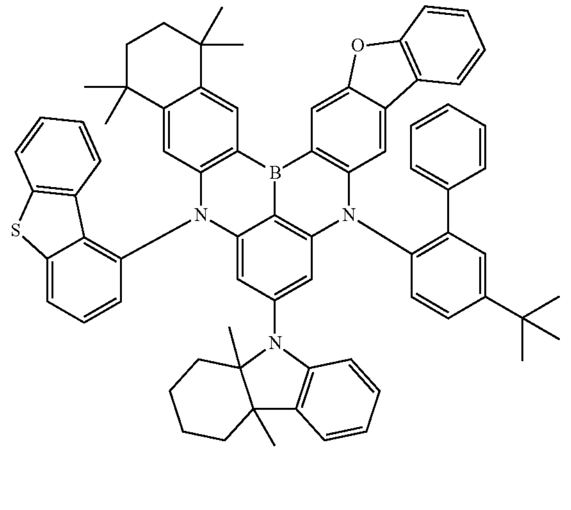
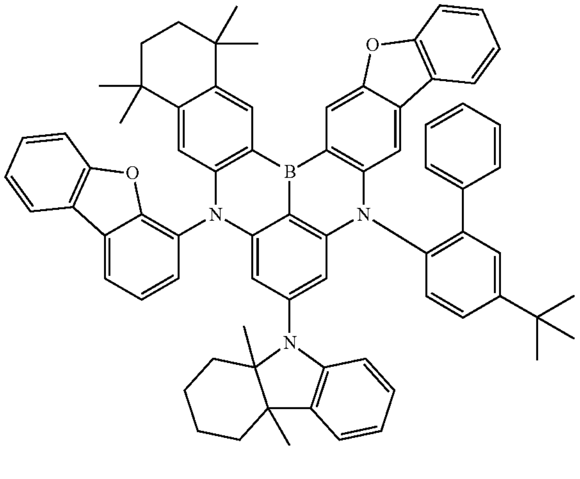
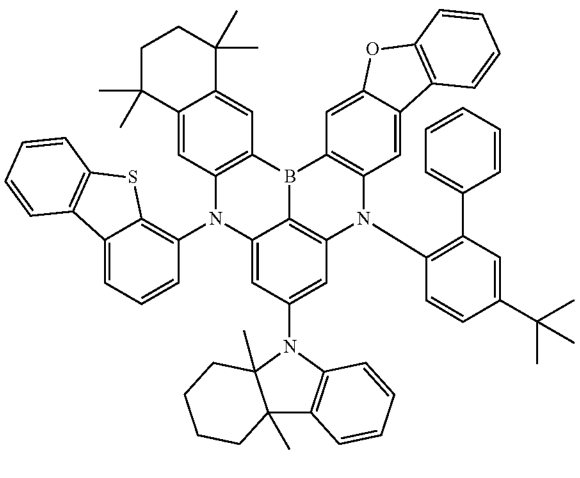
-continued
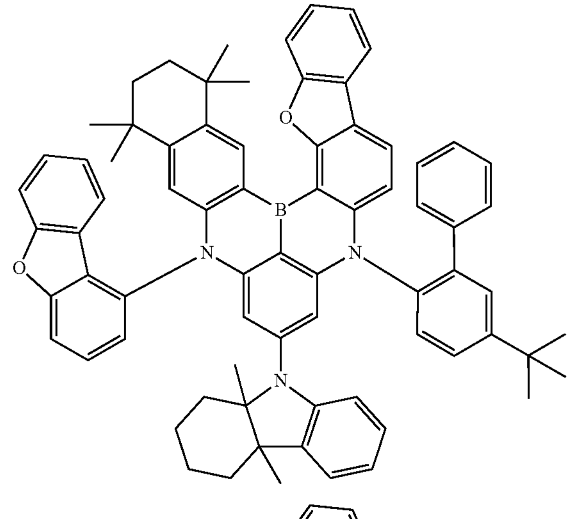
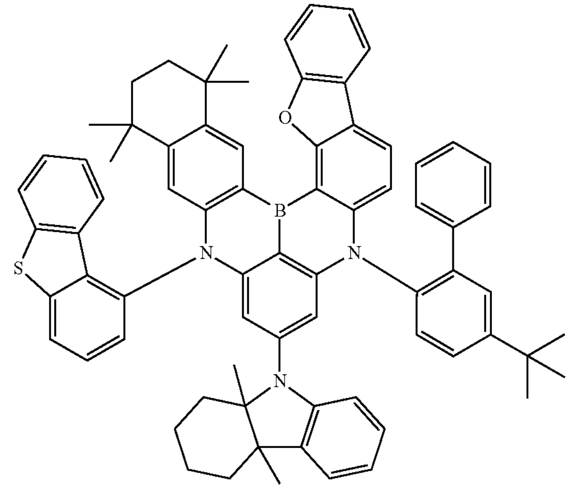
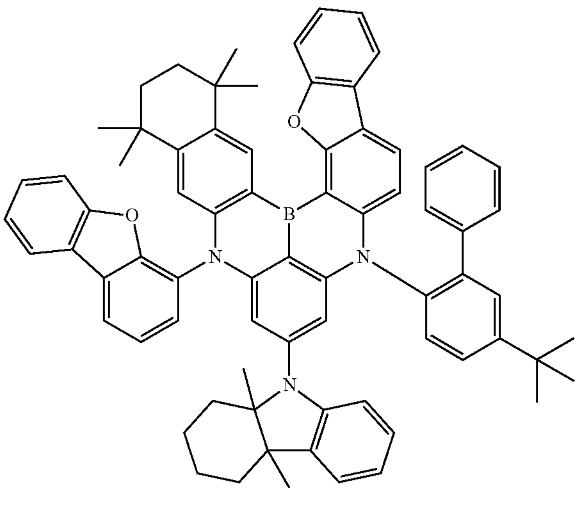

-continued
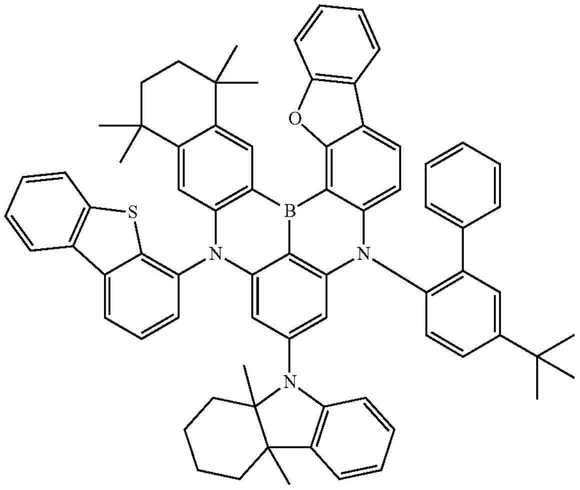
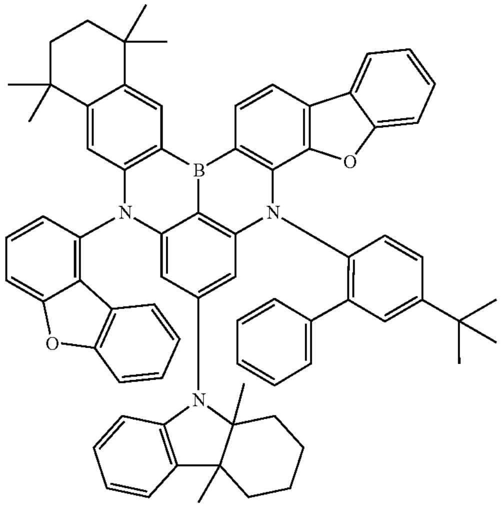
-continued
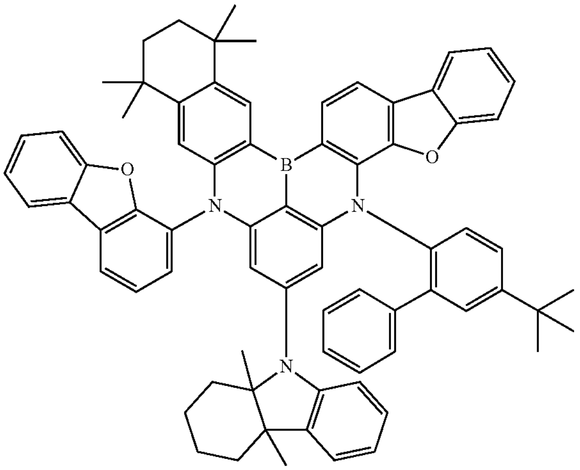
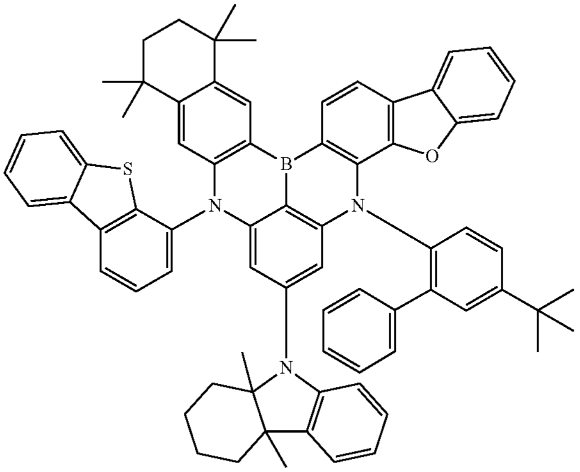
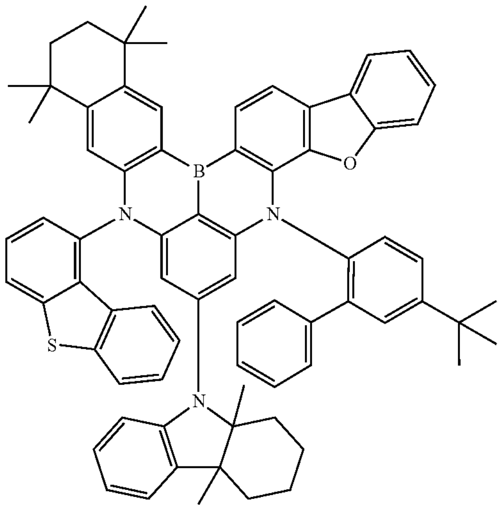
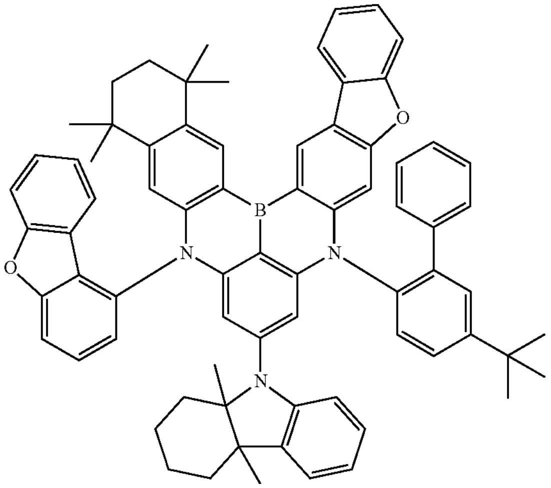

-continued
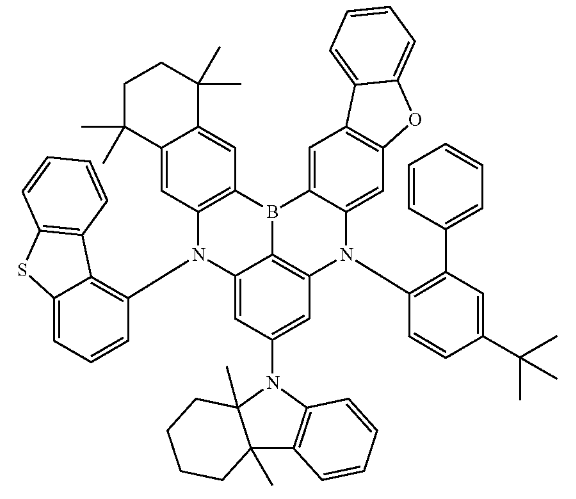
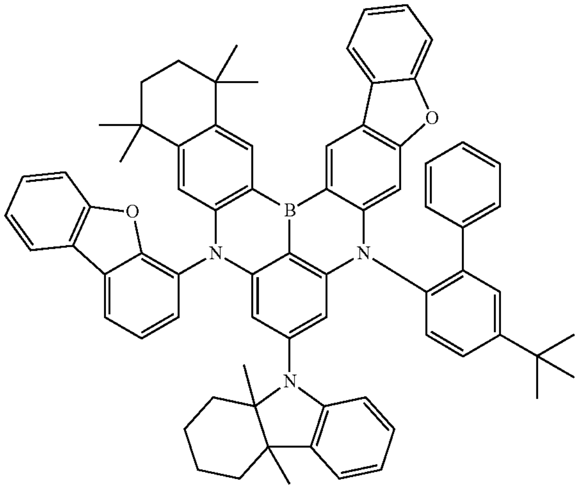
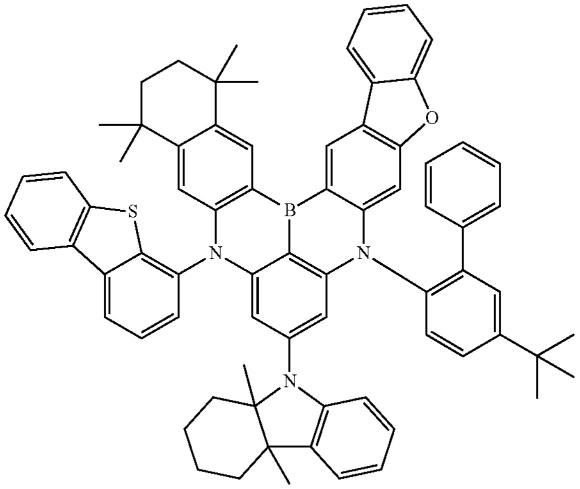
-continued
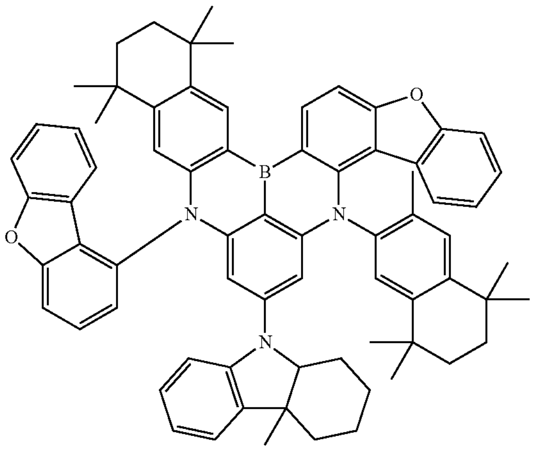
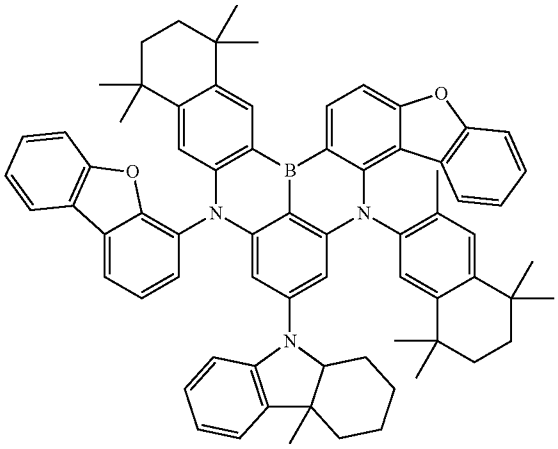
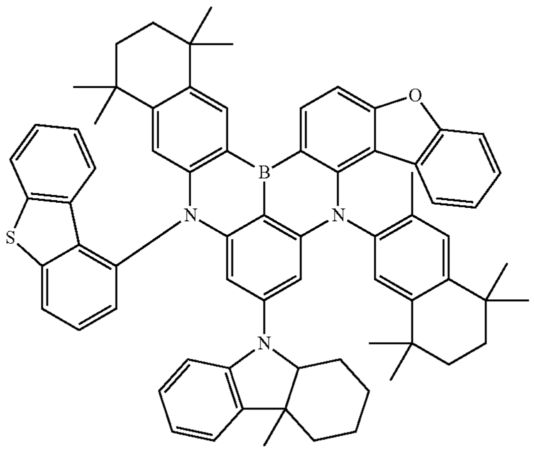

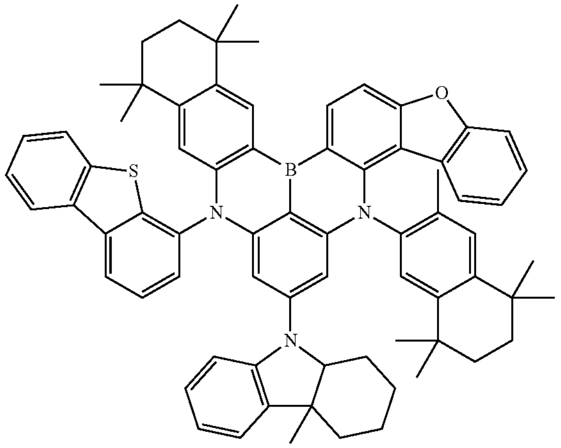
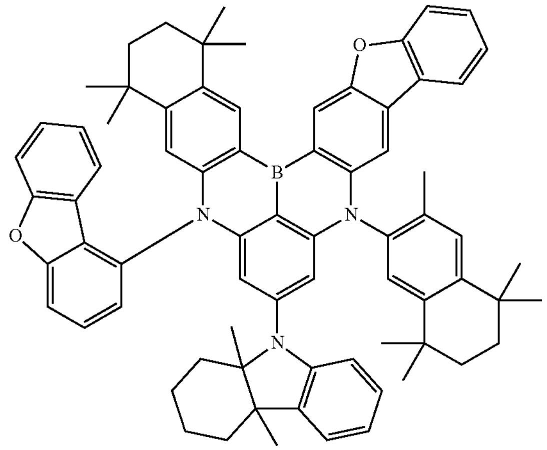
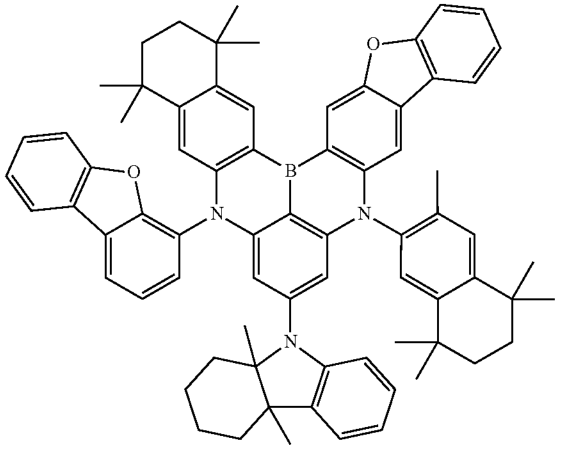
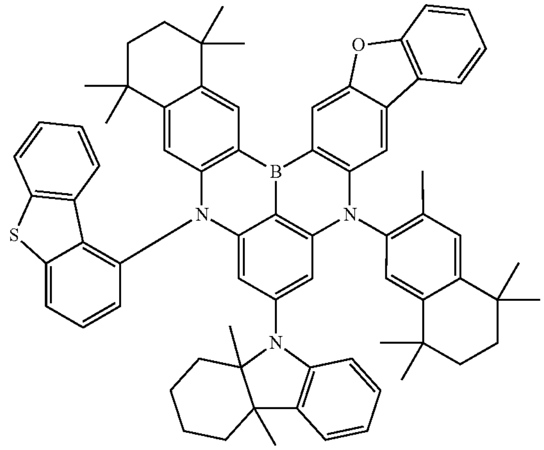
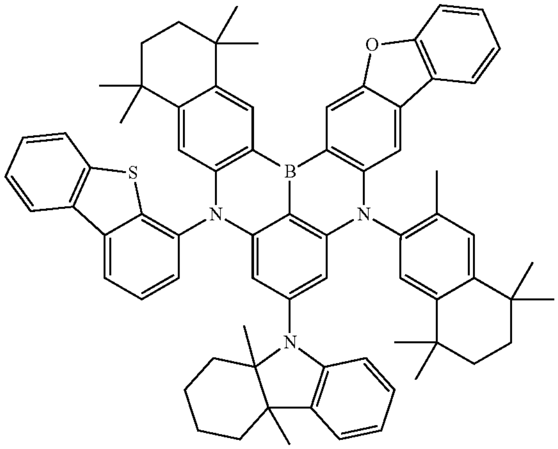
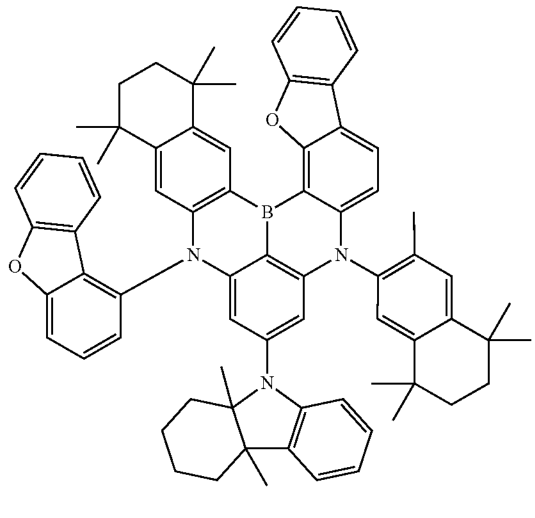

-continued
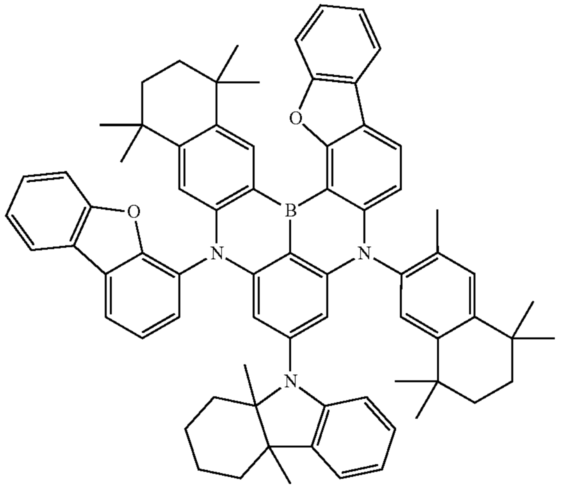
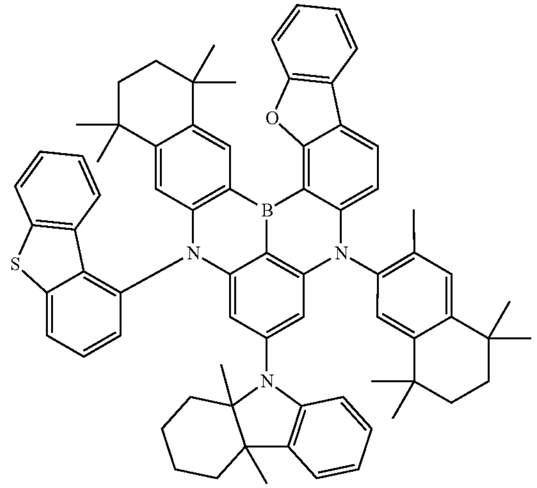
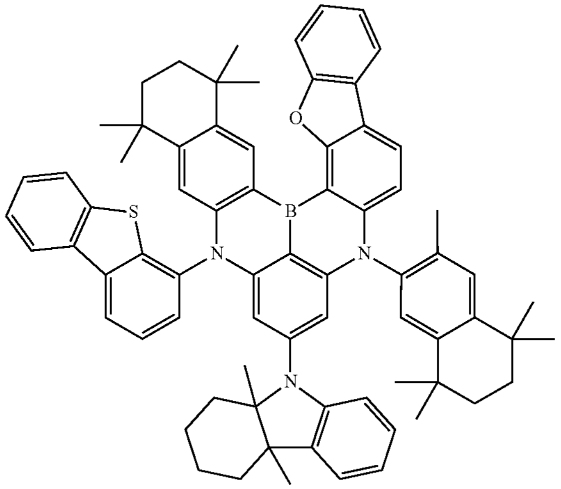
-continued
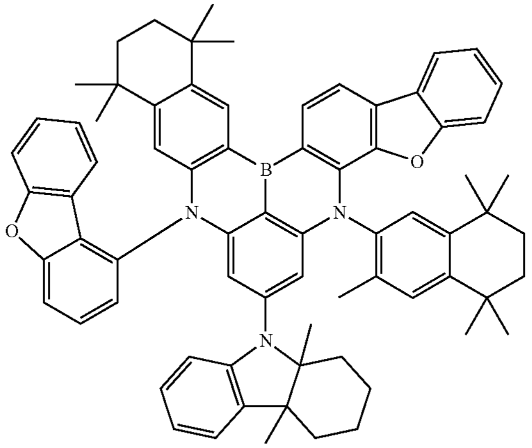
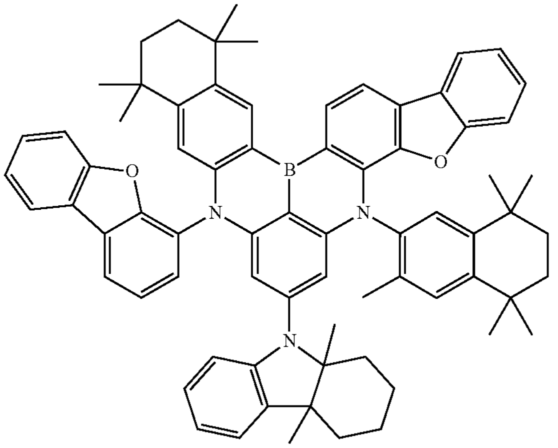
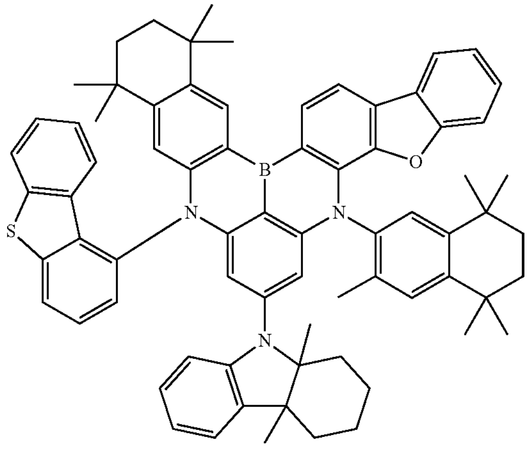

-continued
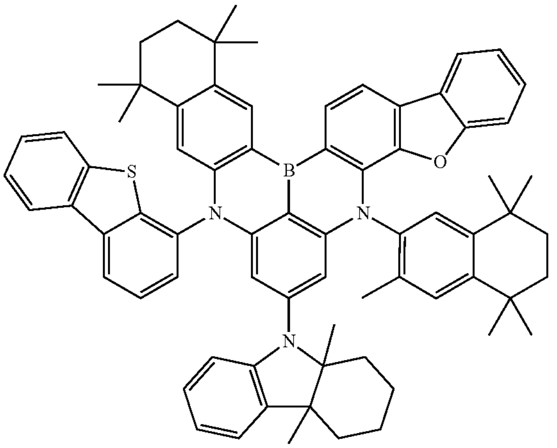
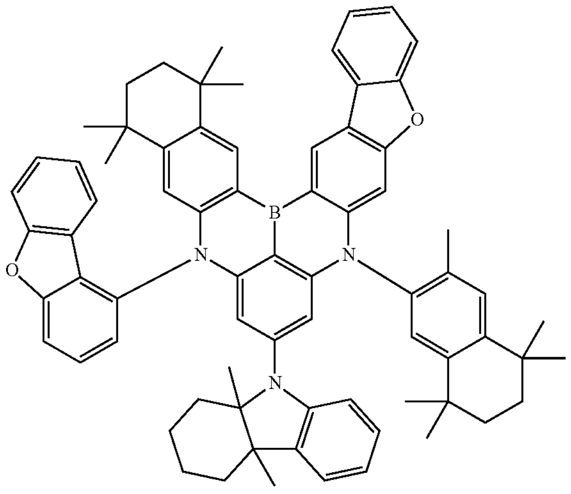
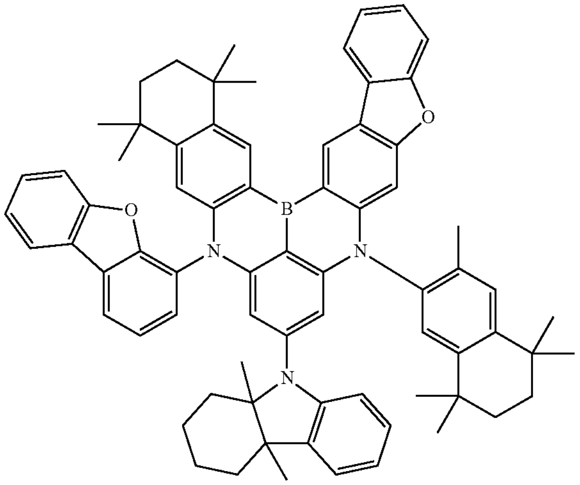
-continued
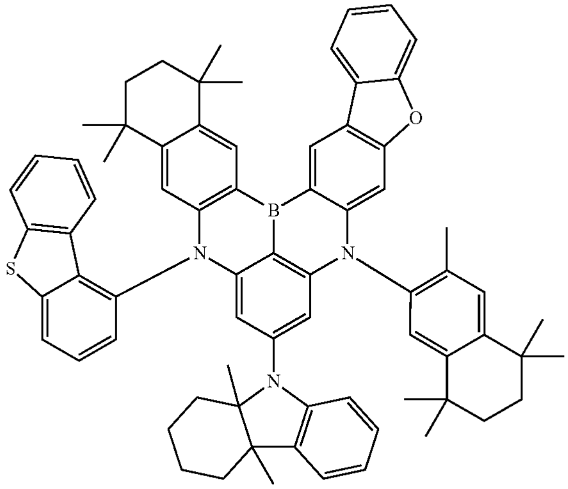
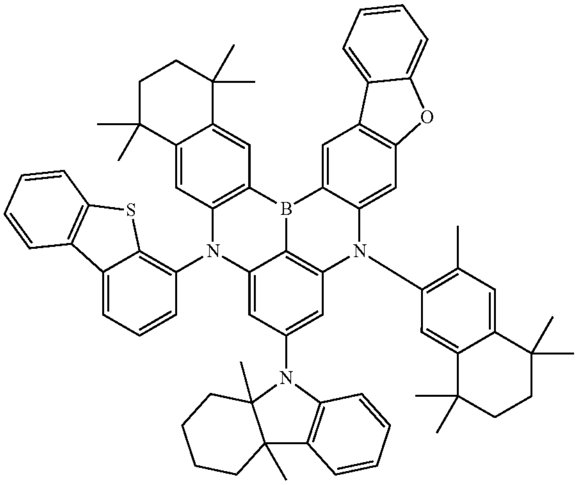
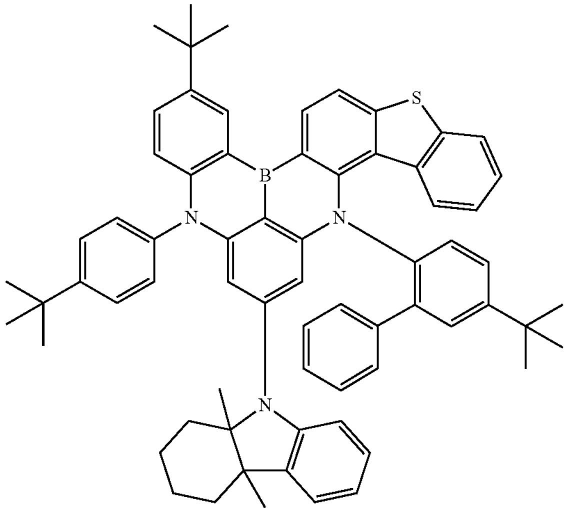

-continued
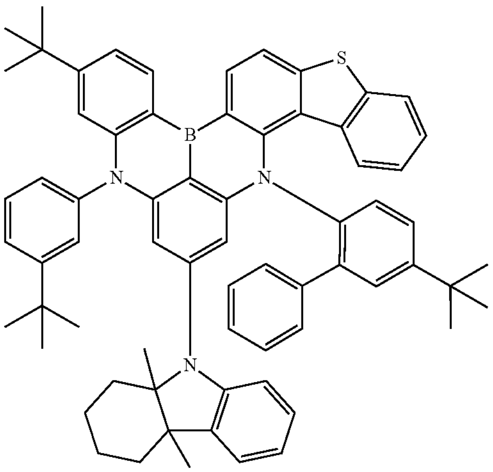
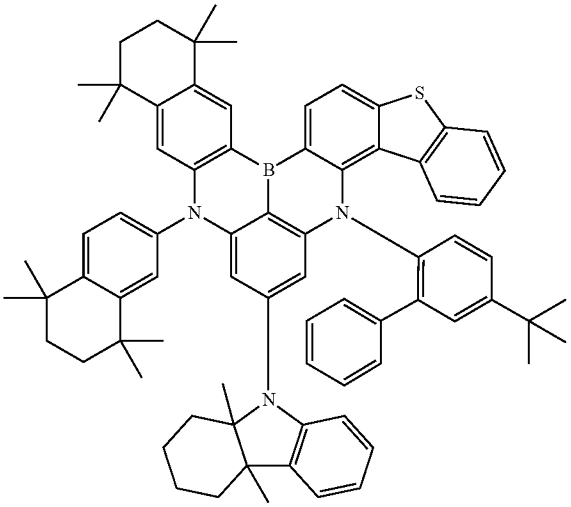
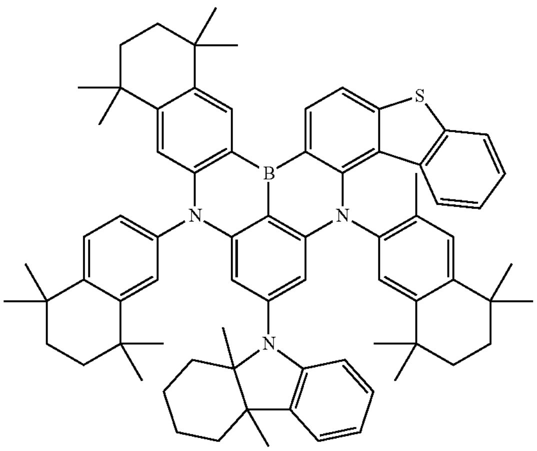
-continued
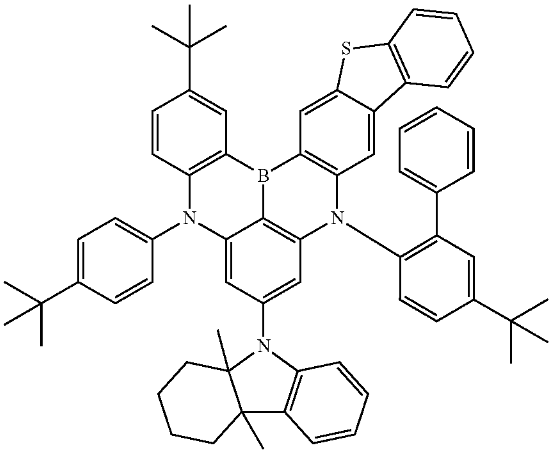
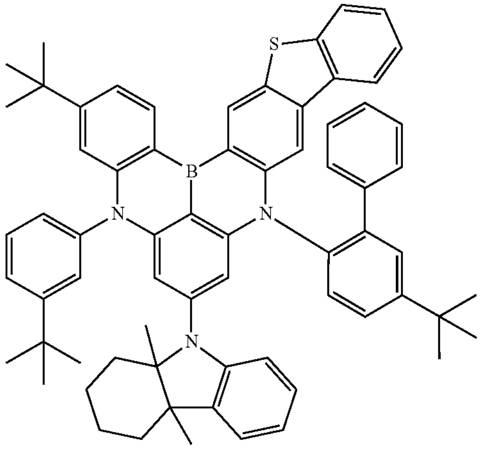
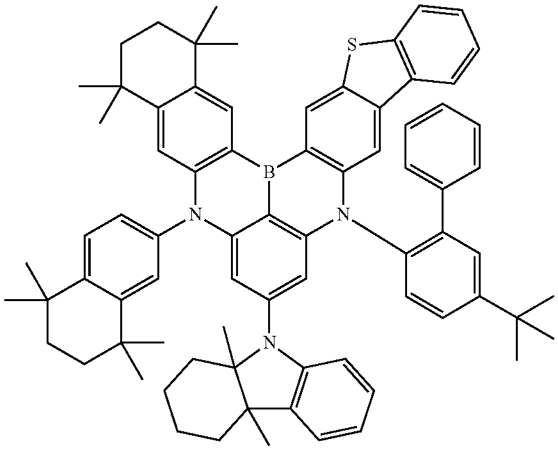

-continued
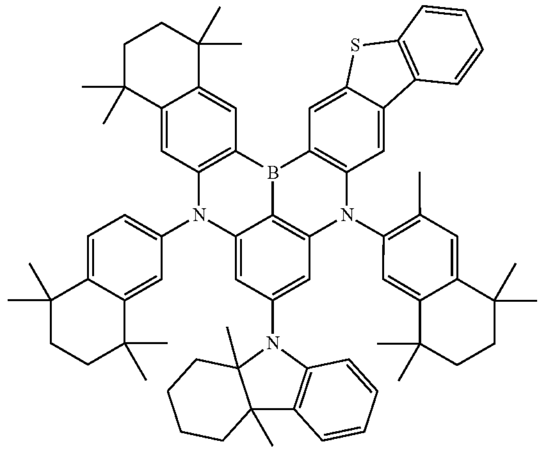
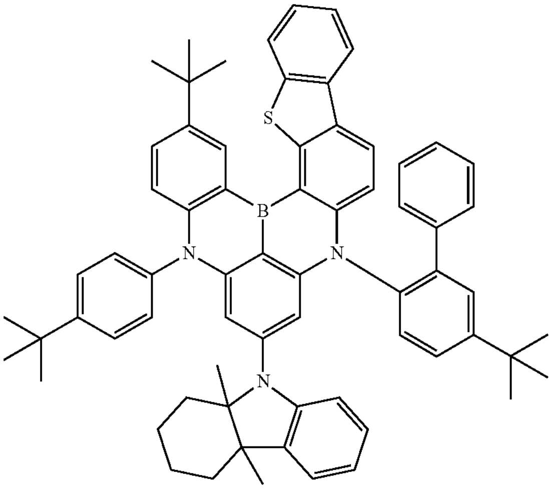
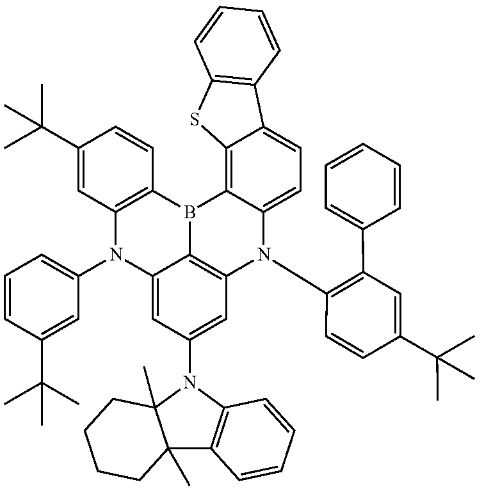
-continued
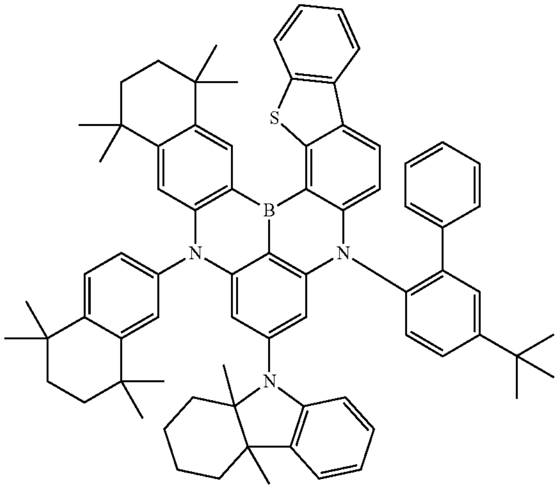
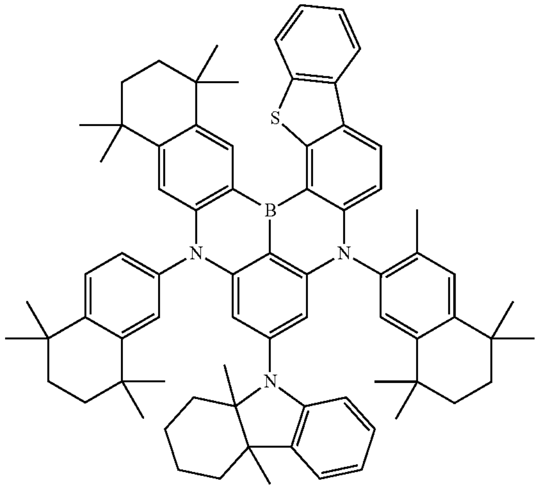
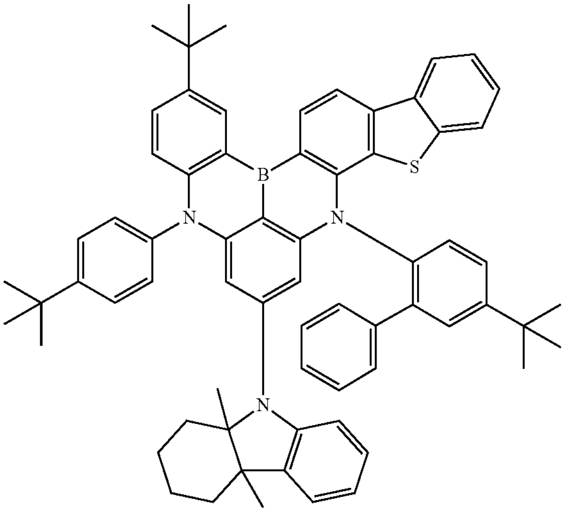

-continued
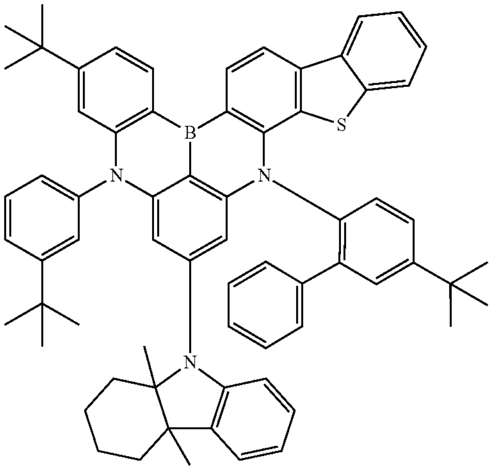
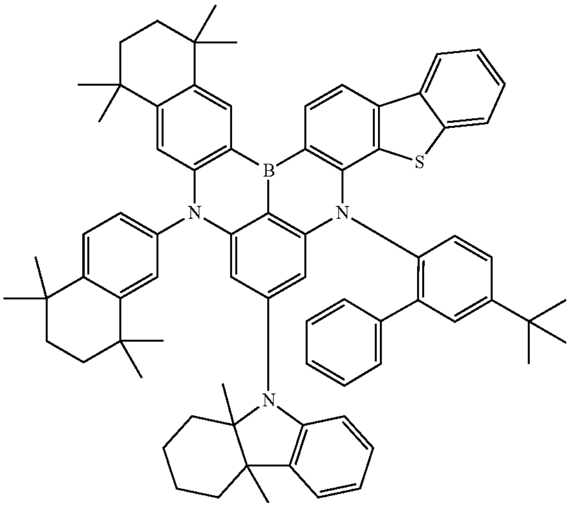
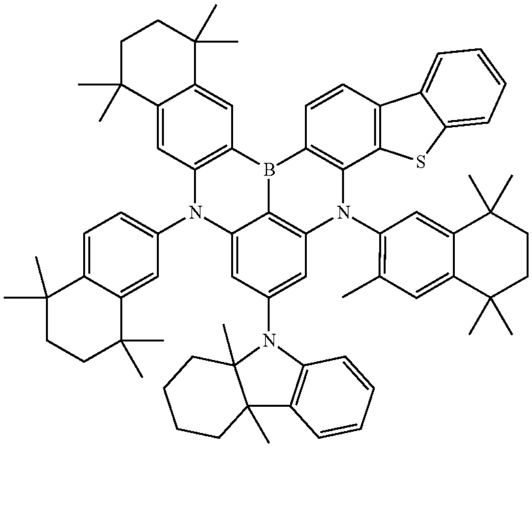
-continued
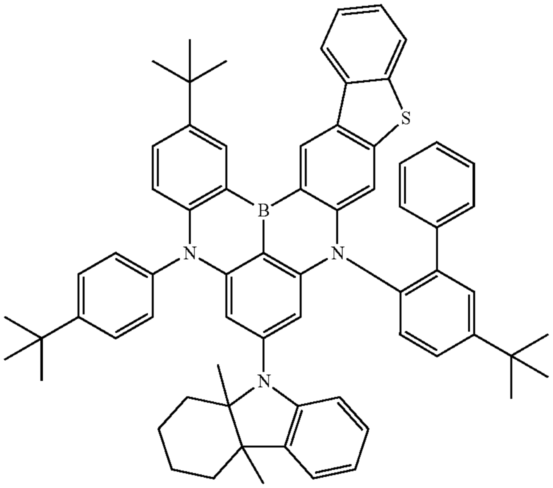
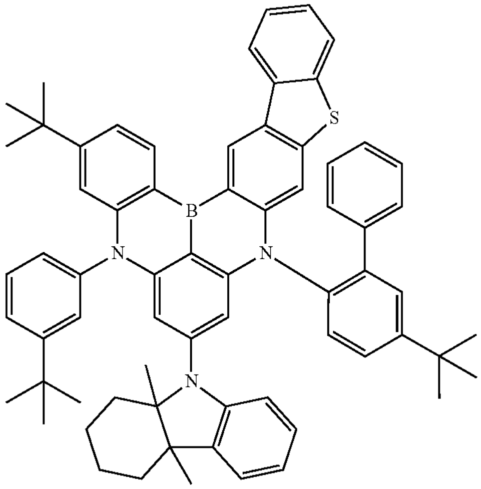
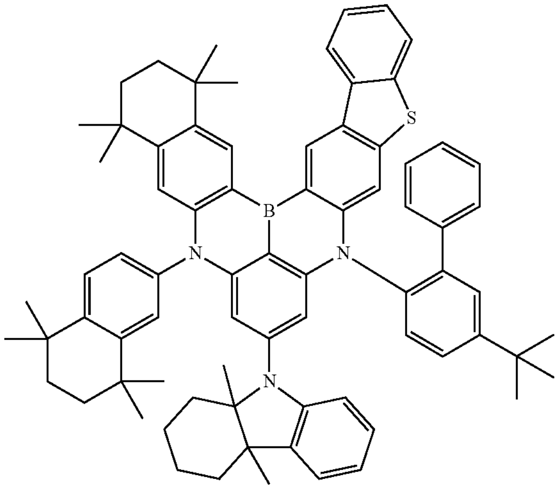

-continued
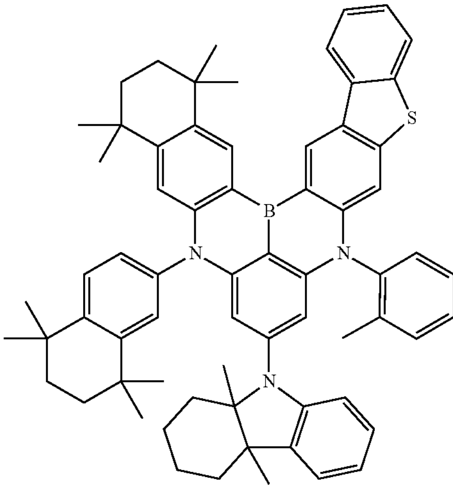
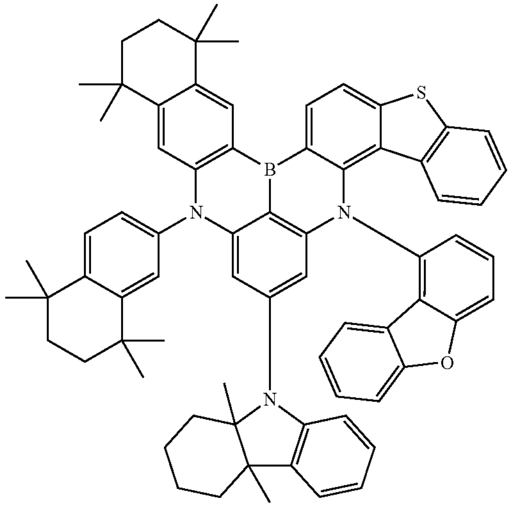
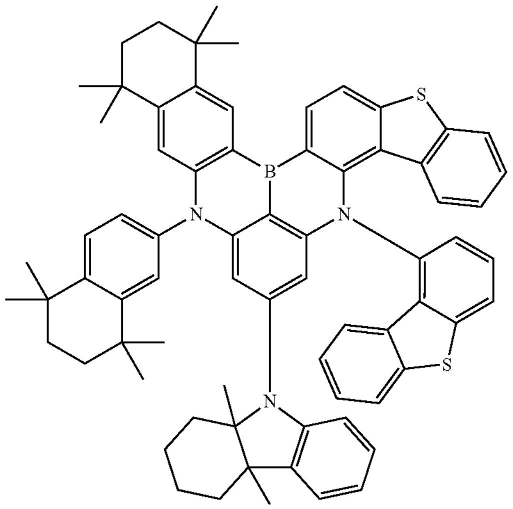
-continued
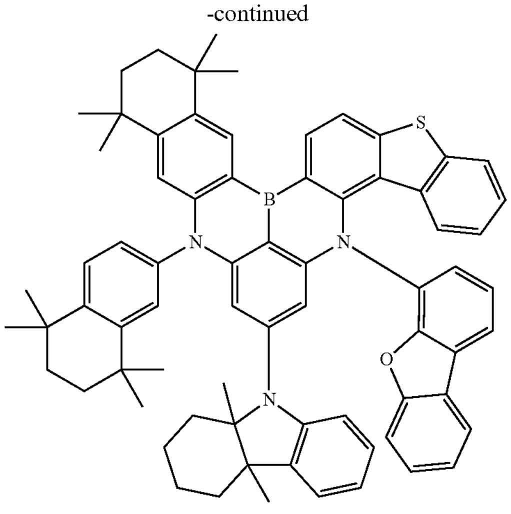
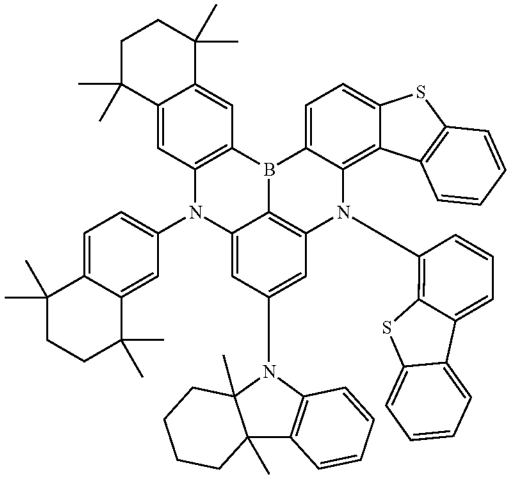
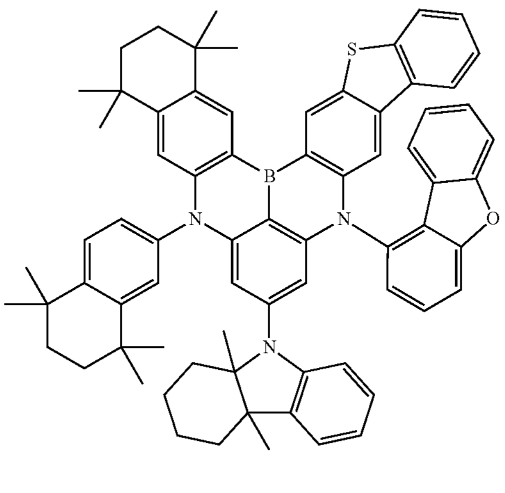

-continued
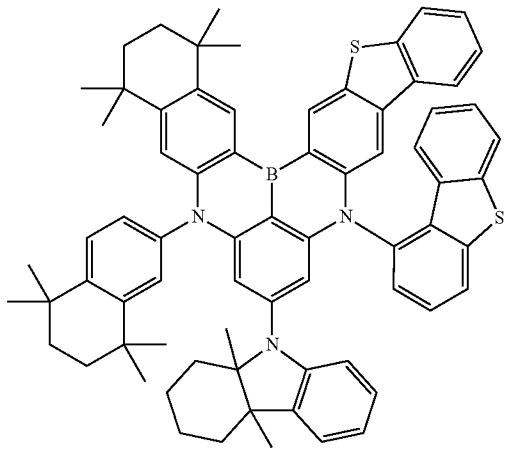
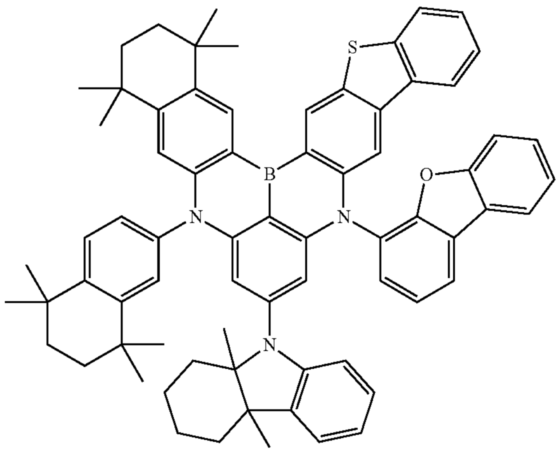
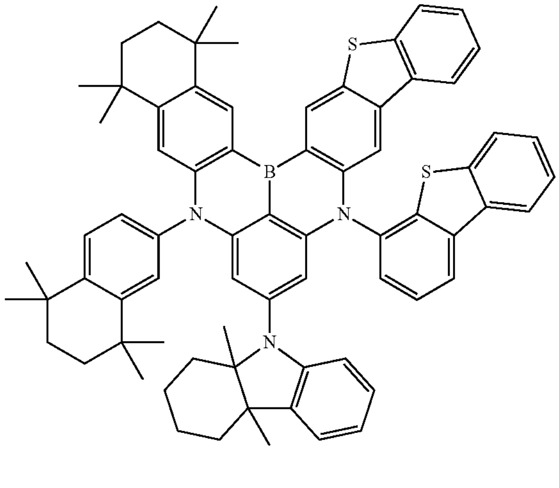
-continued
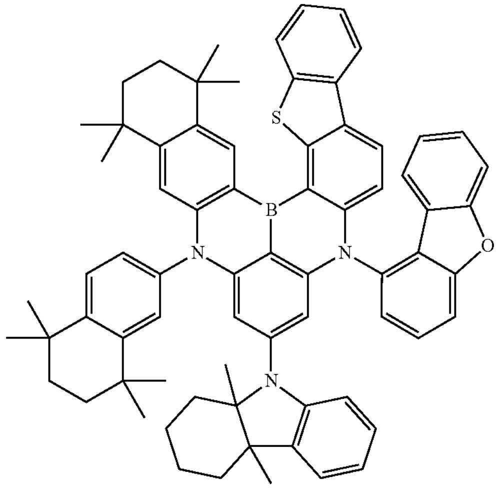
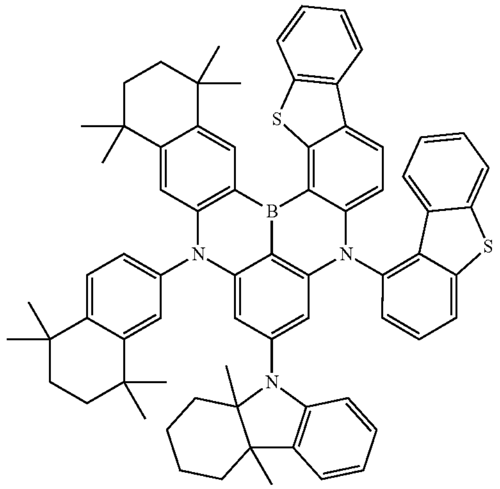
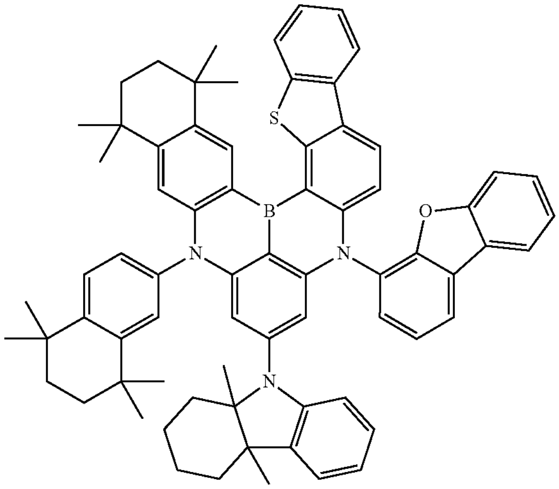

-continued
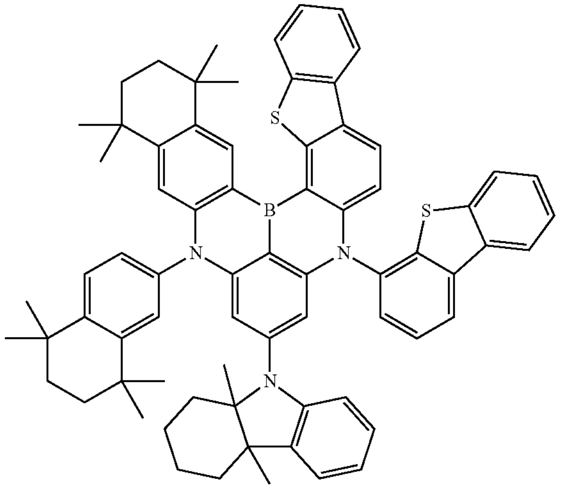
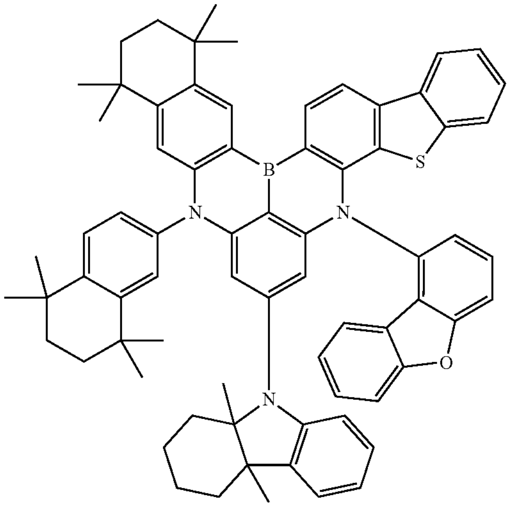
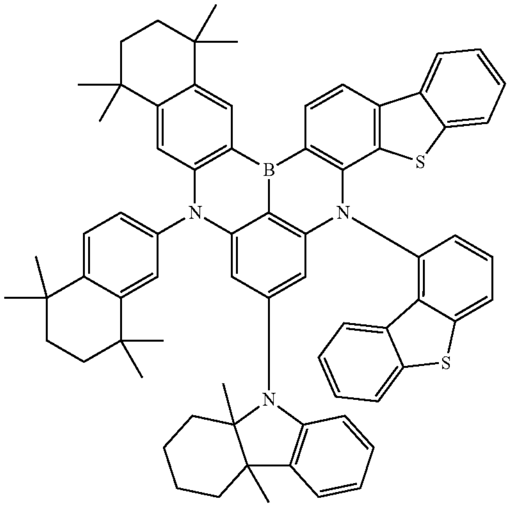
-continued
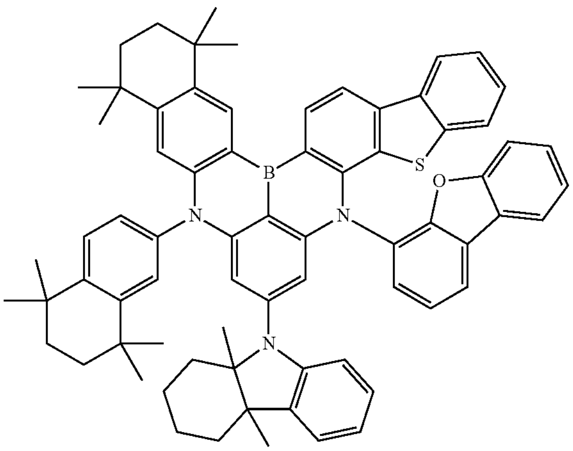
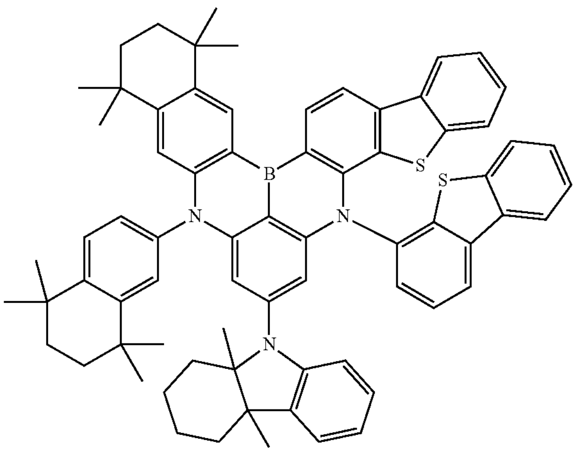
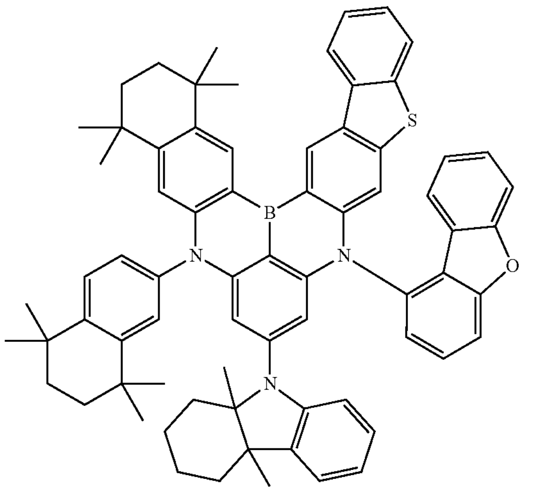

-continued
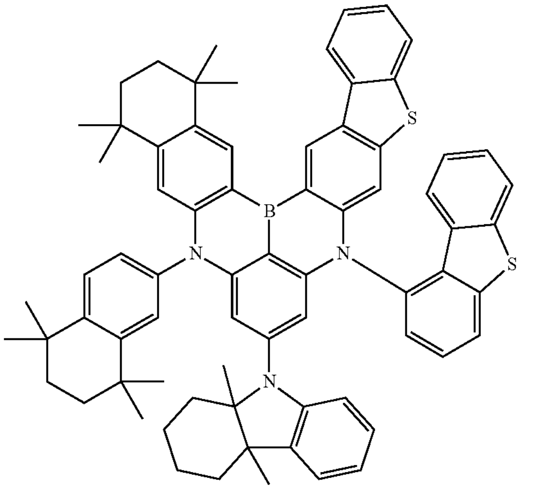
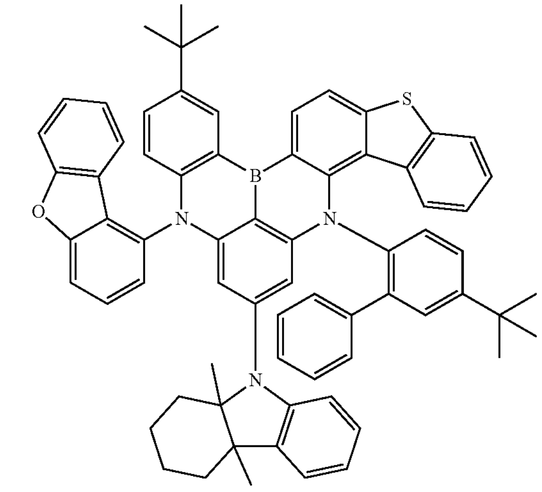
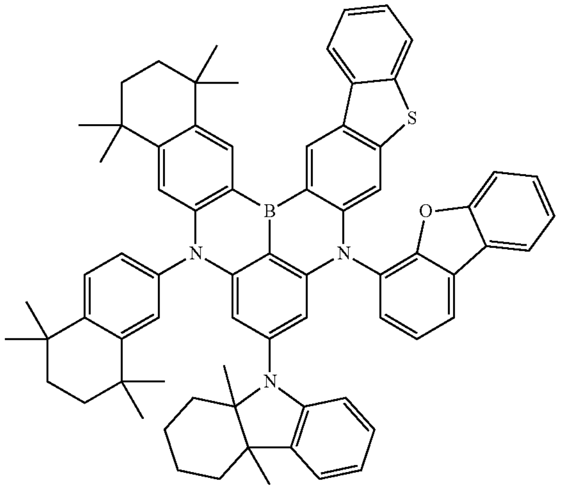
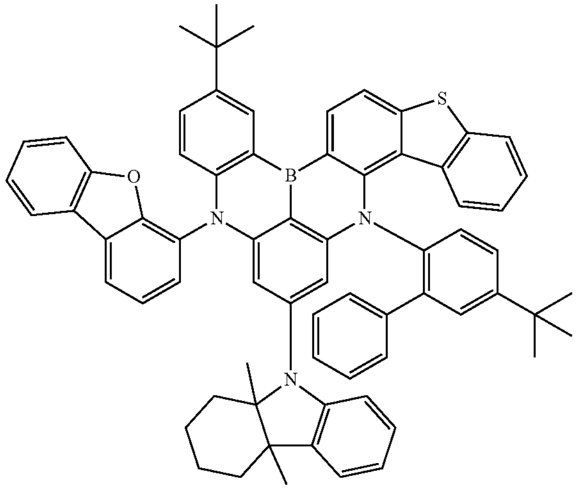
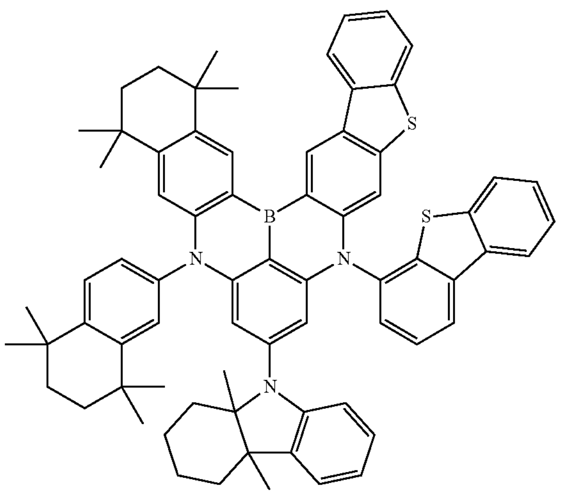 [SMILES: CC1(C)CCC(C)(C)c2cc(N3c4cc5c(cc4B4c6cc7c(cc6N(c6cccc8c6sc6ccccc68)c6cc(N8c9ccccc9C9(C)CCCCC89C)cc3c64)sc3ccccc37)C(C)(C)CCC5(C)C)ccc21]
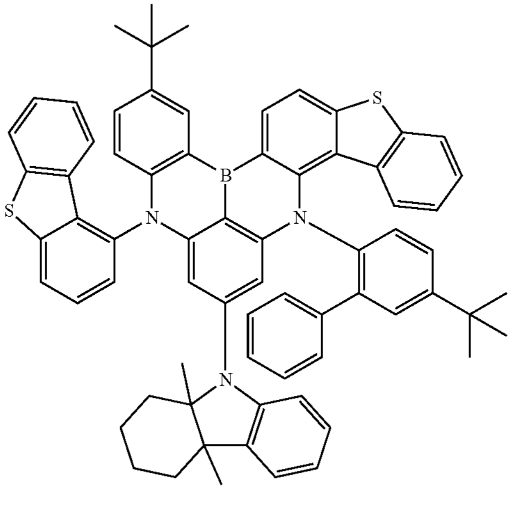

-continued
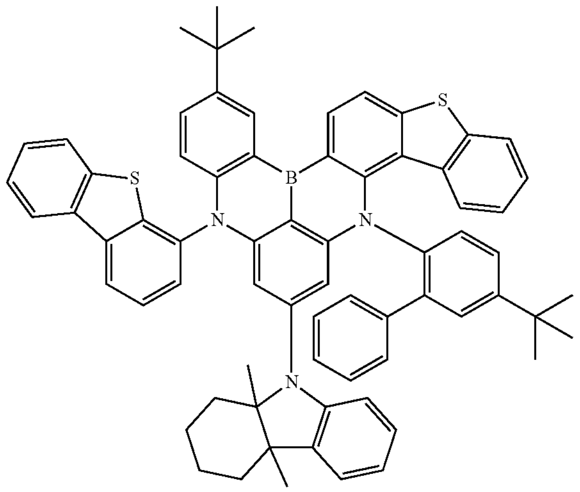
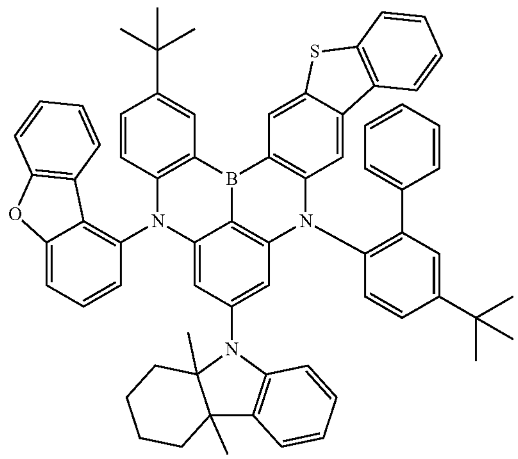
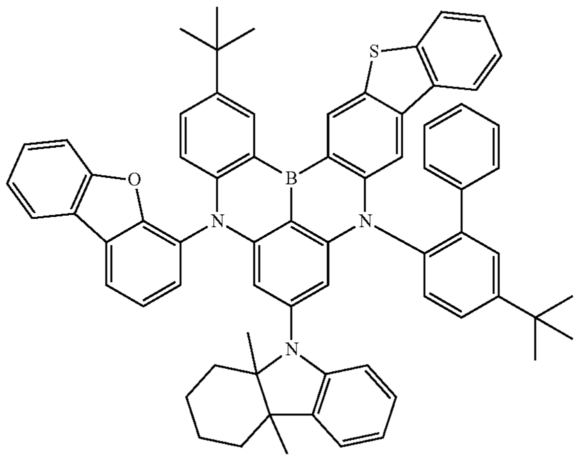
-continued
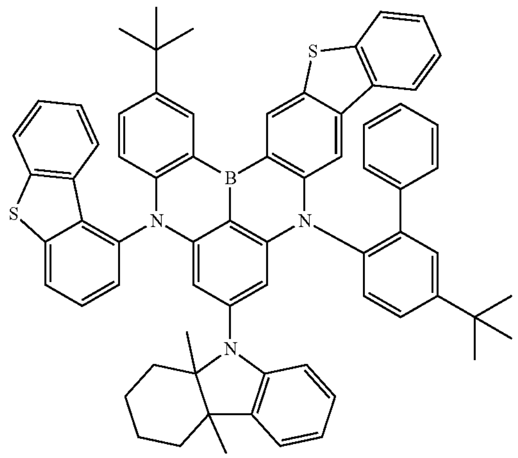
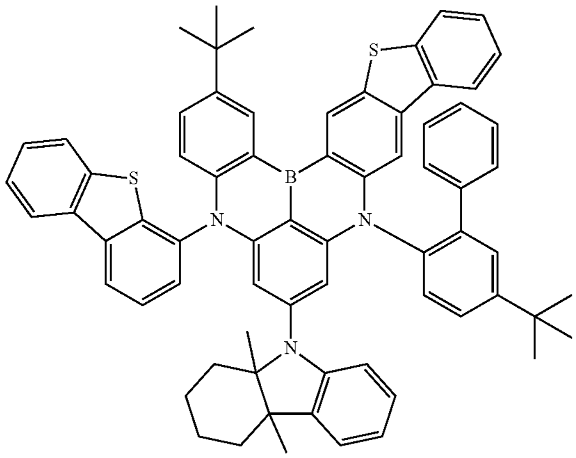
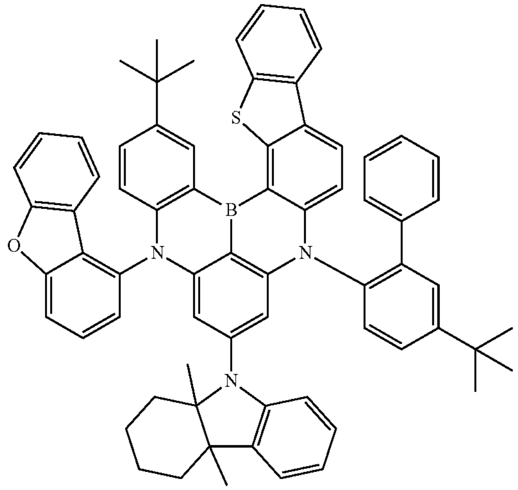

-continued
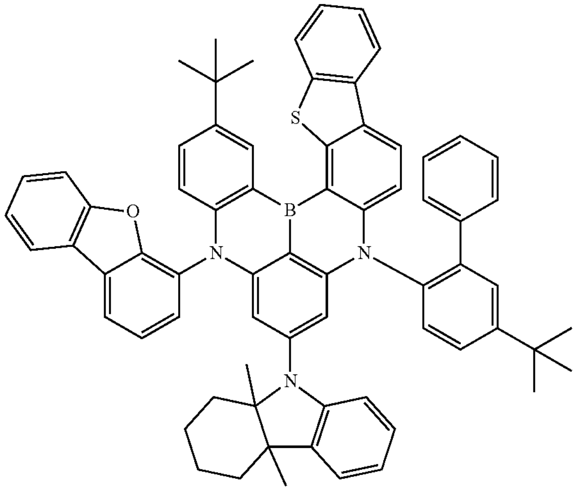
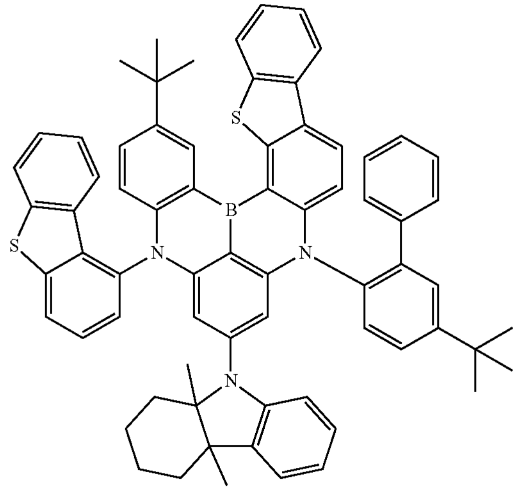
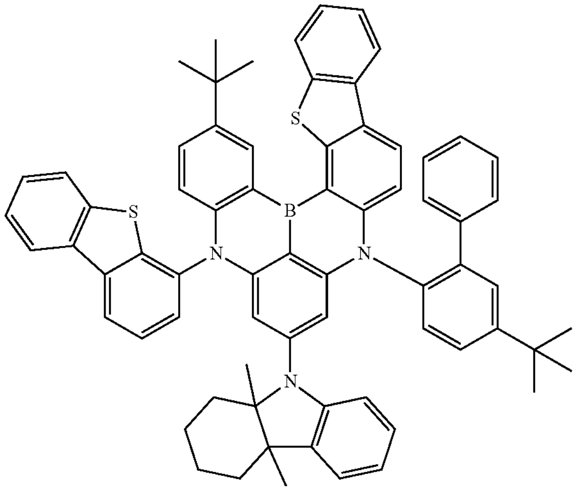
-continued
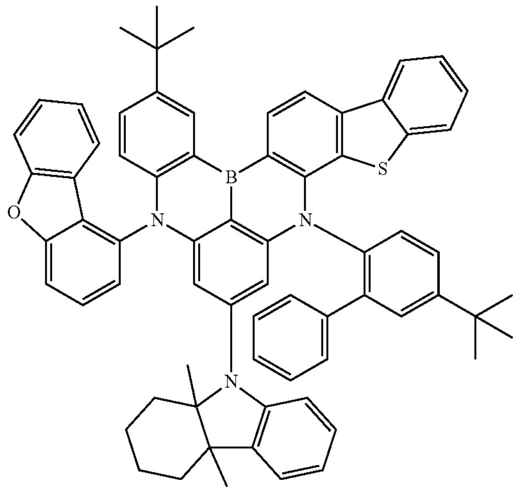
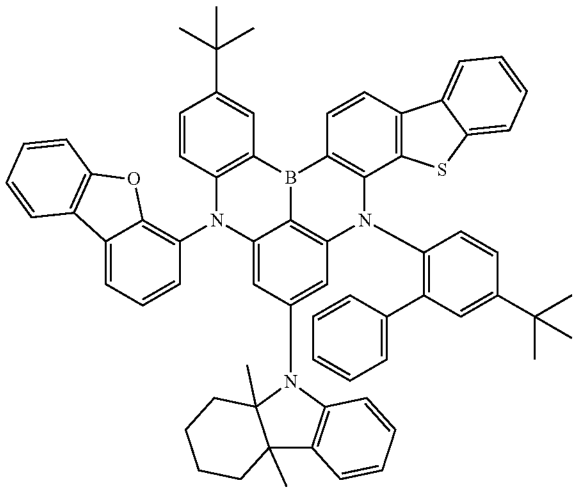
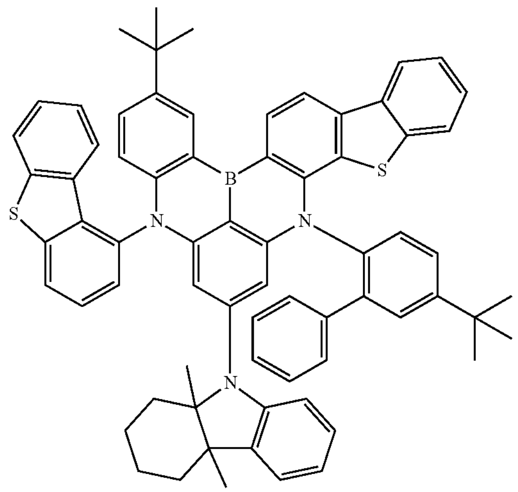

-continued
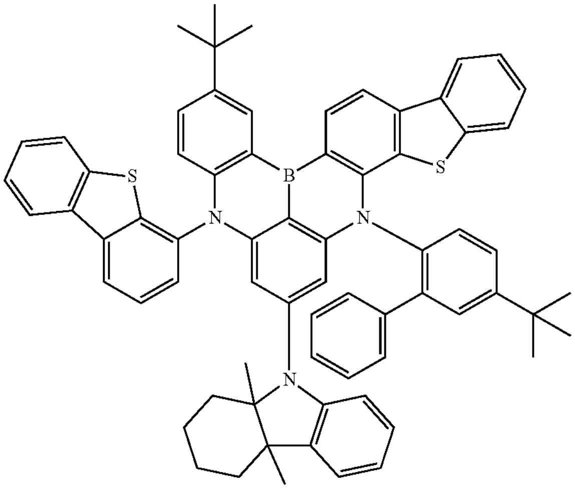
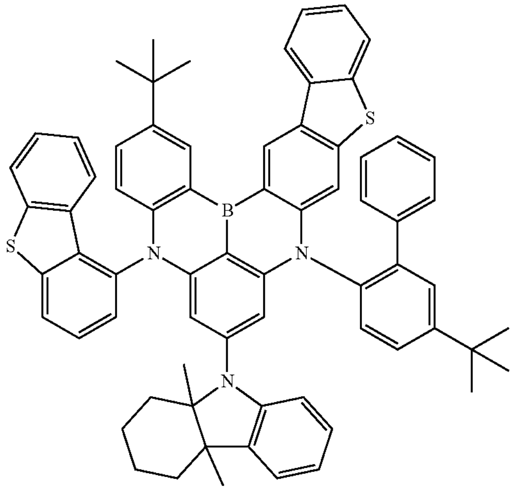
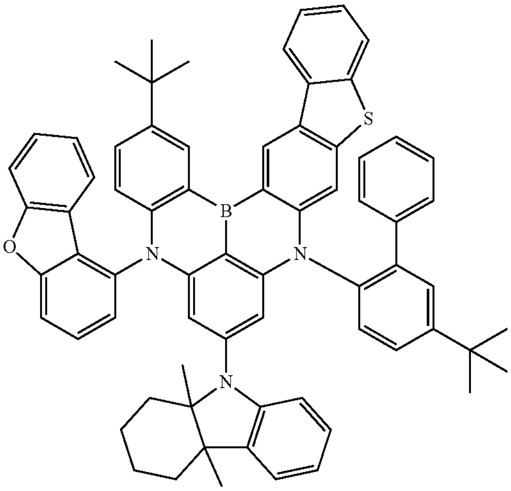
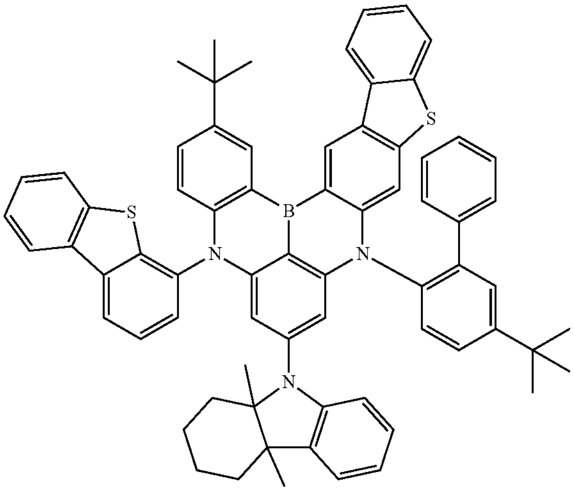
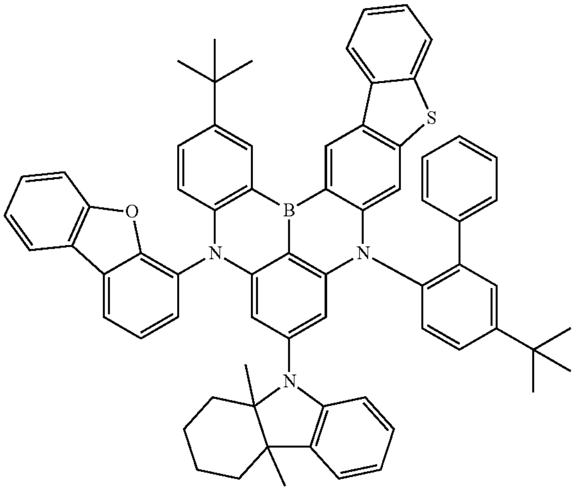
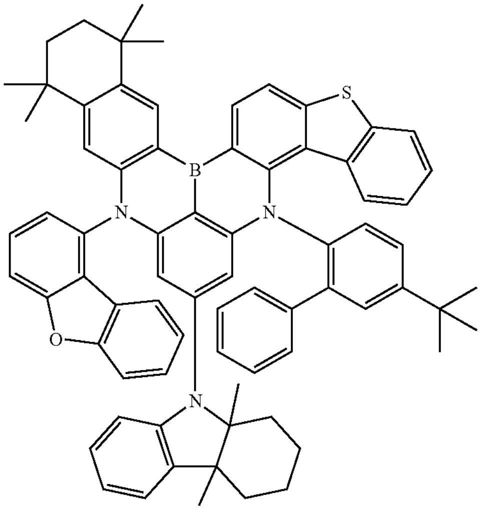
-continued -continued
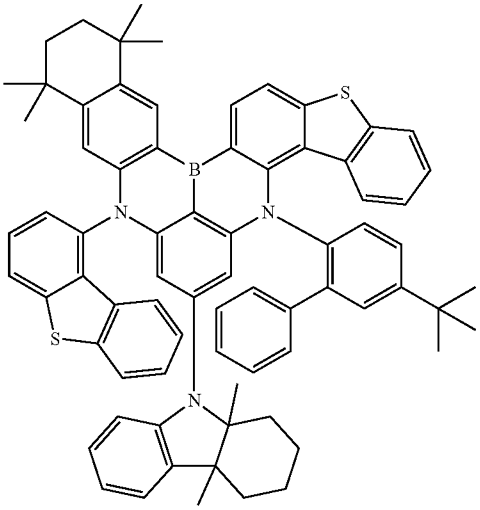
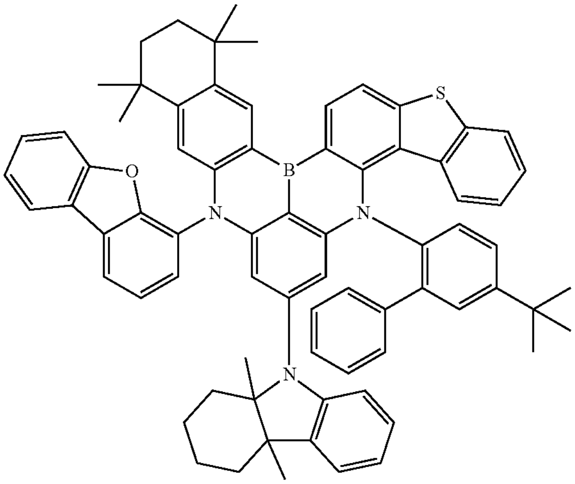
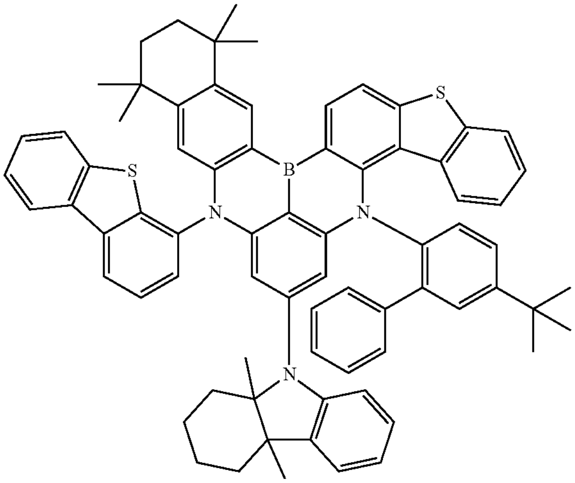
-continued
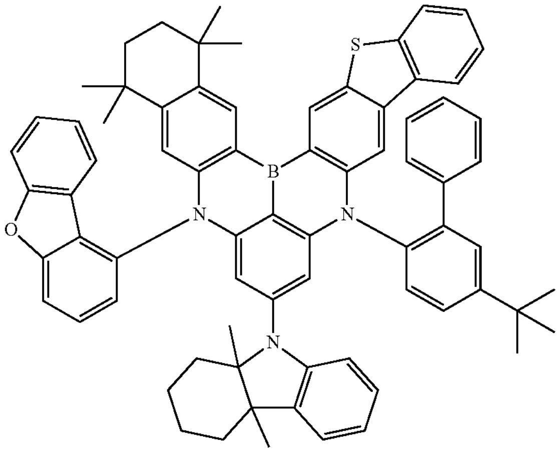
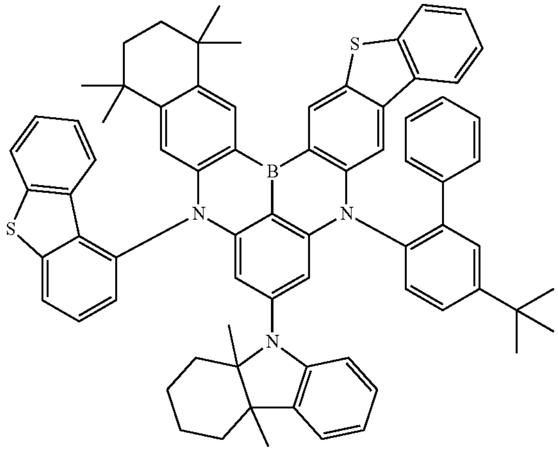
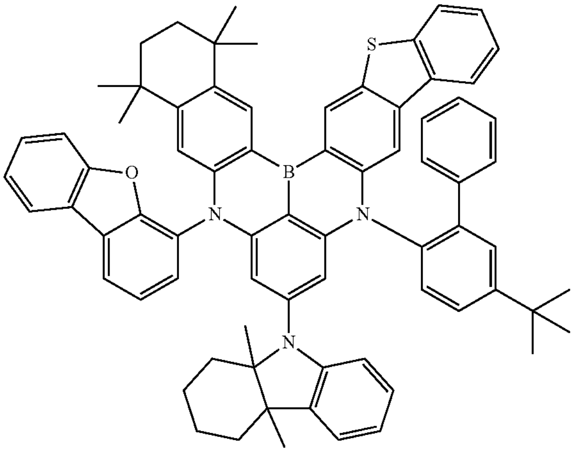

-continued
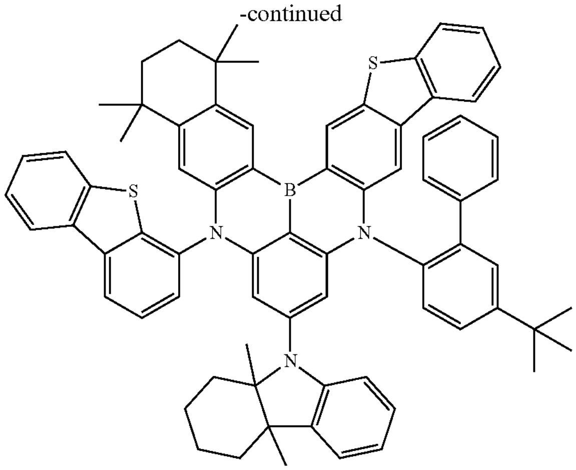
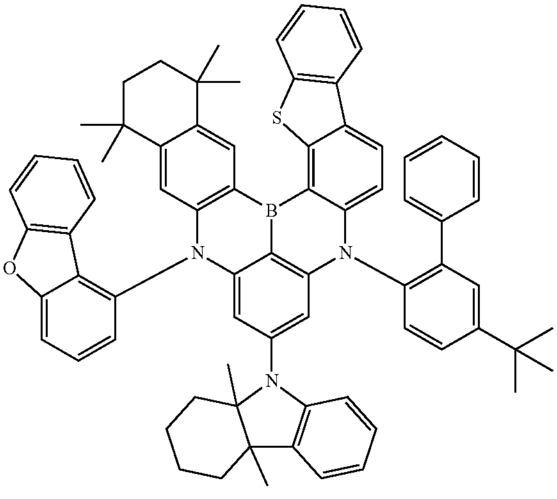
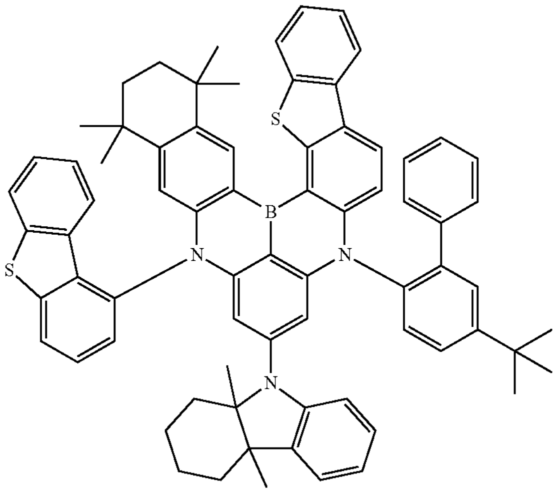
-continued
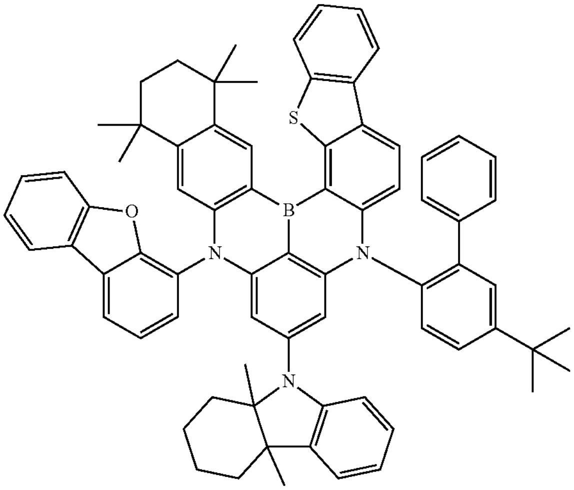
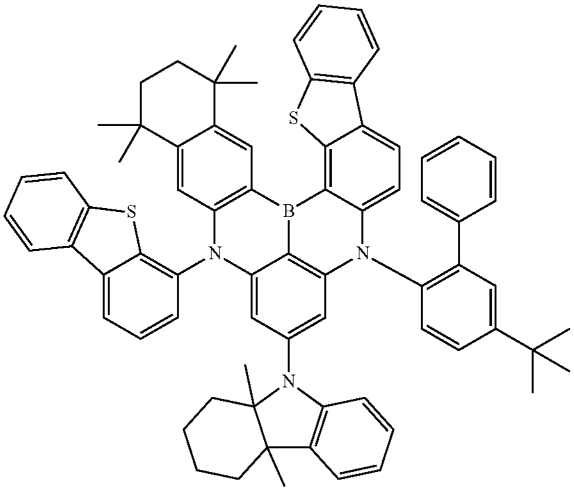
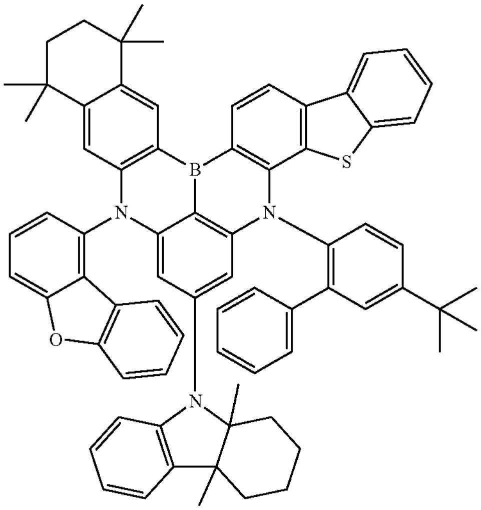

-continued
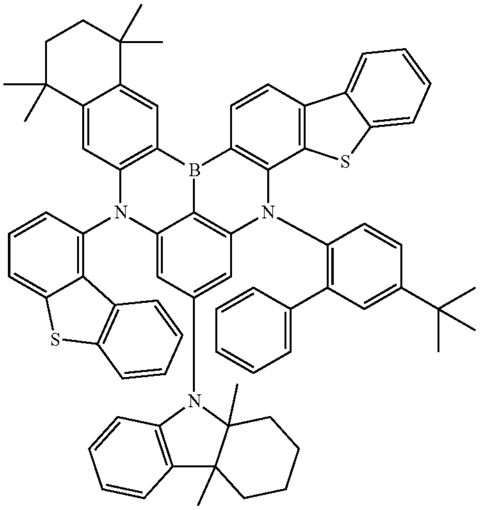
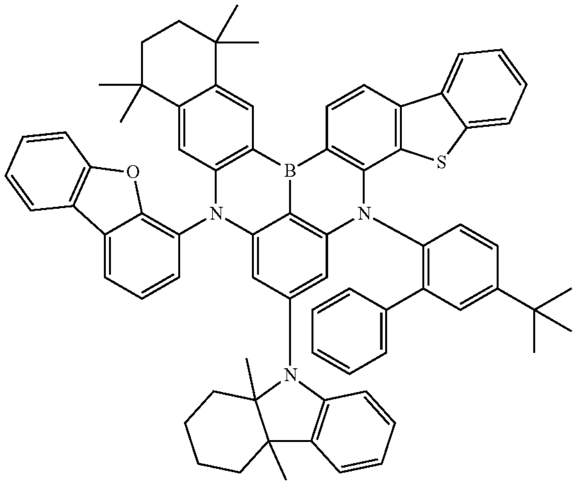
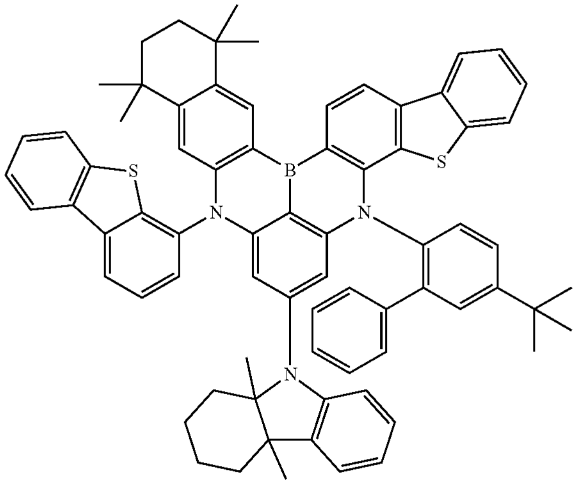
-continued
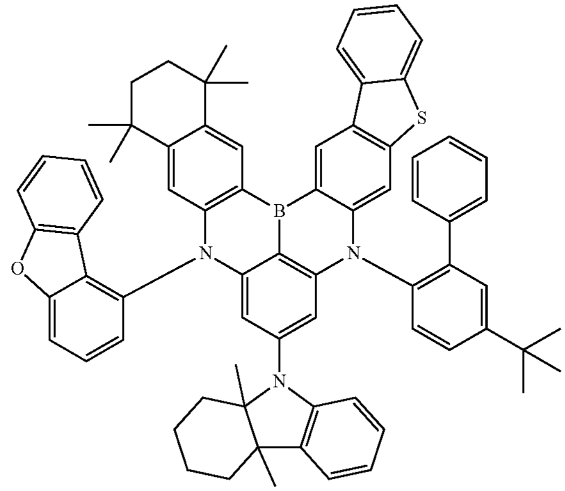
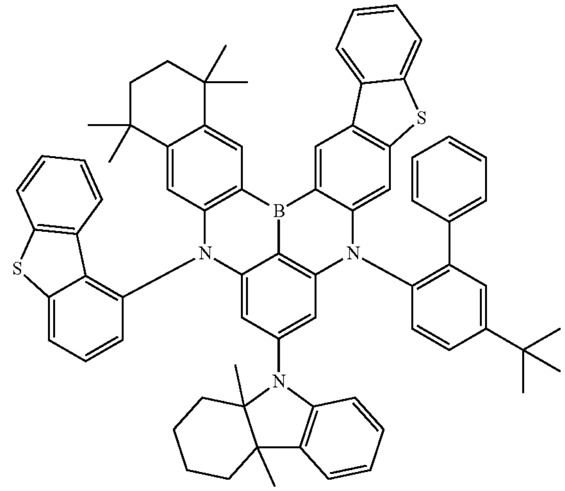
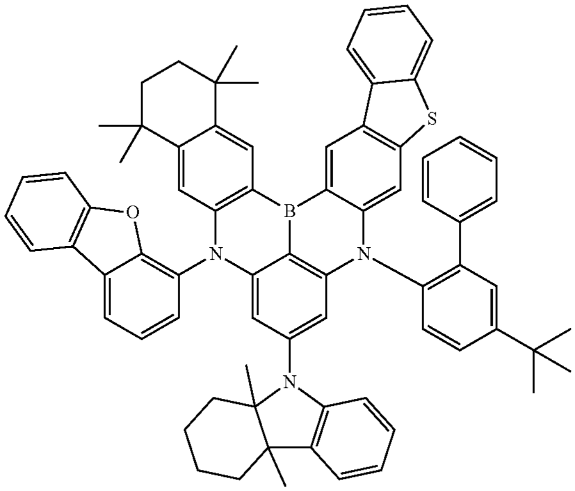

-continued
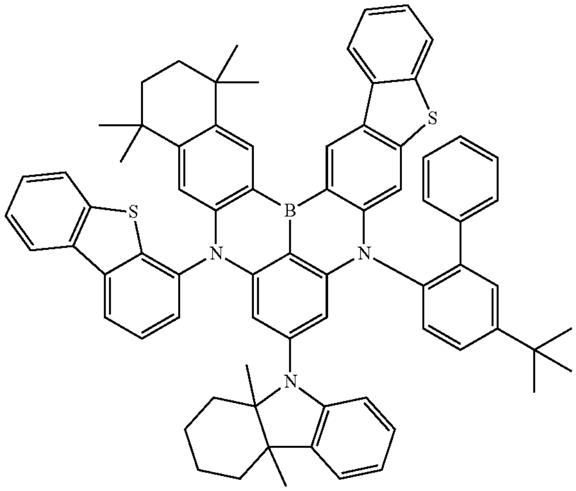
-continued
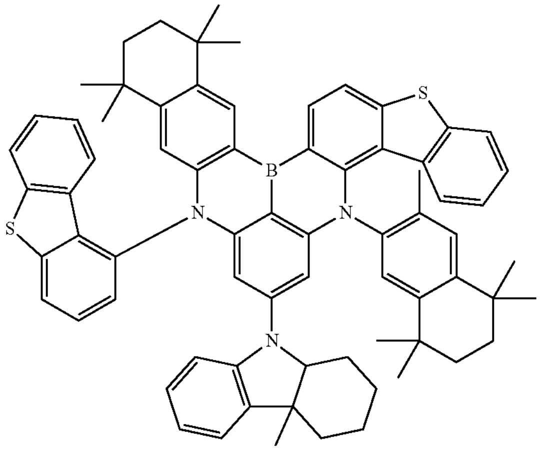
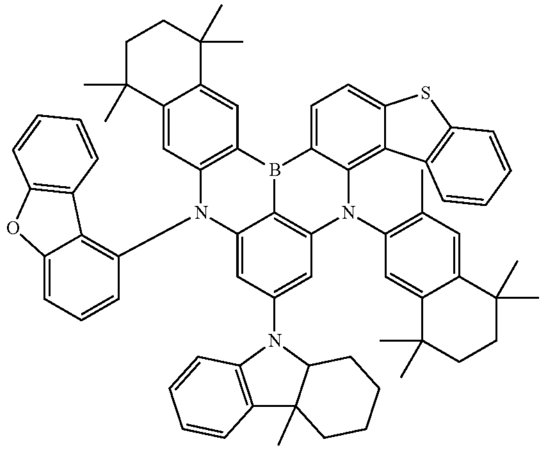
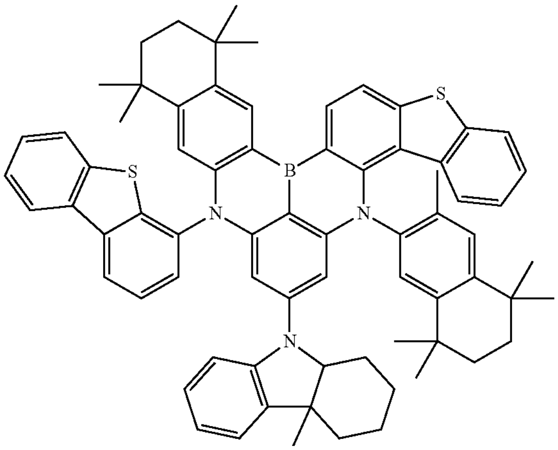
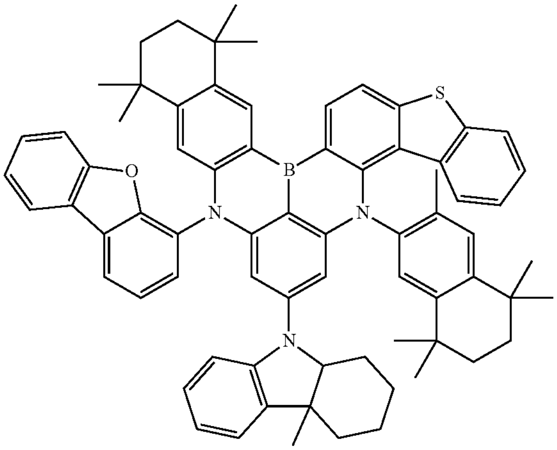
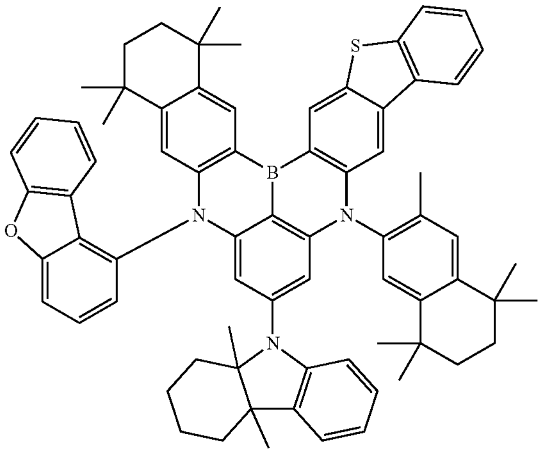

-continued
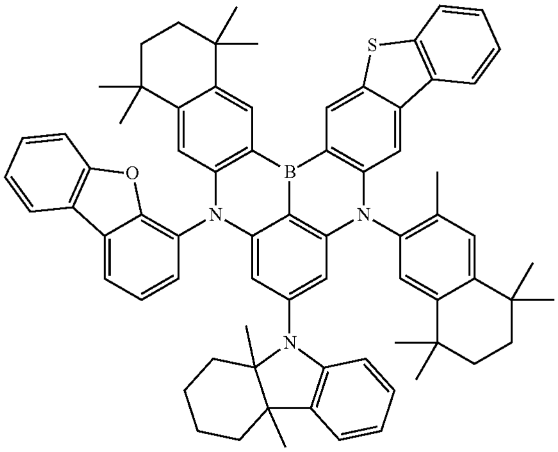
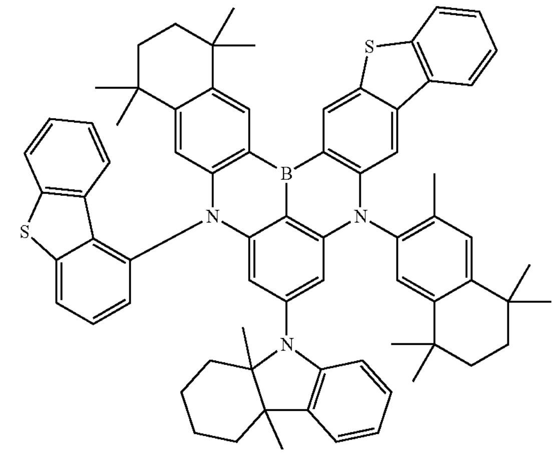
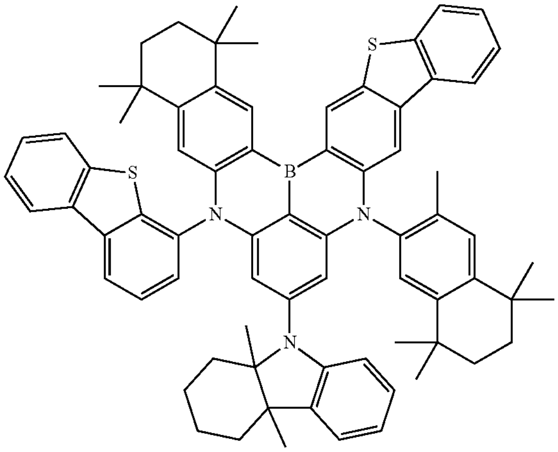
-continued
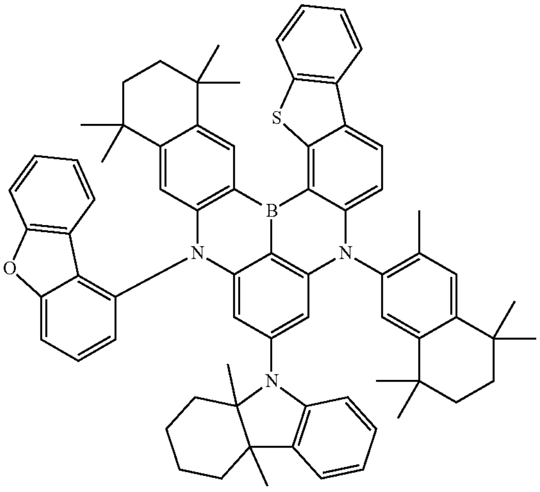
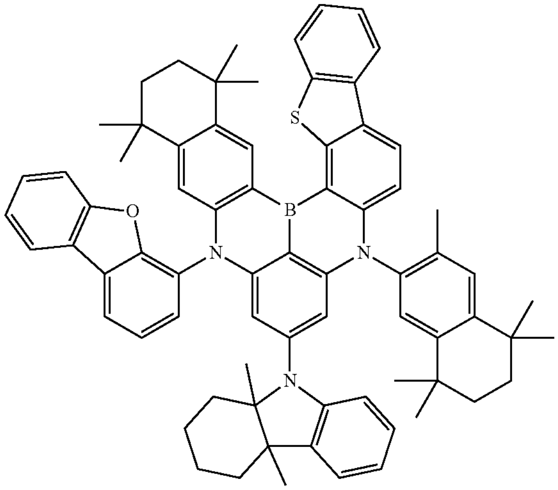
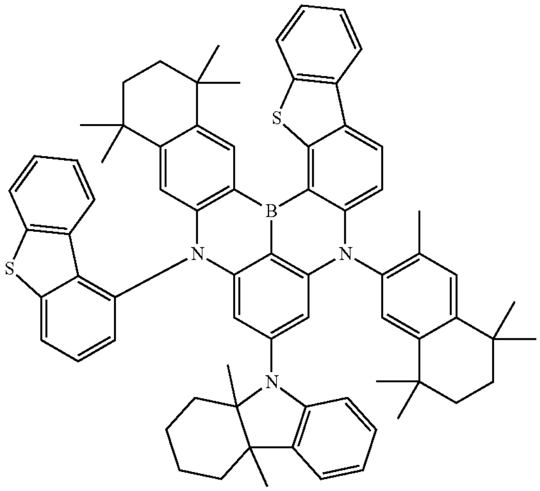

-continued
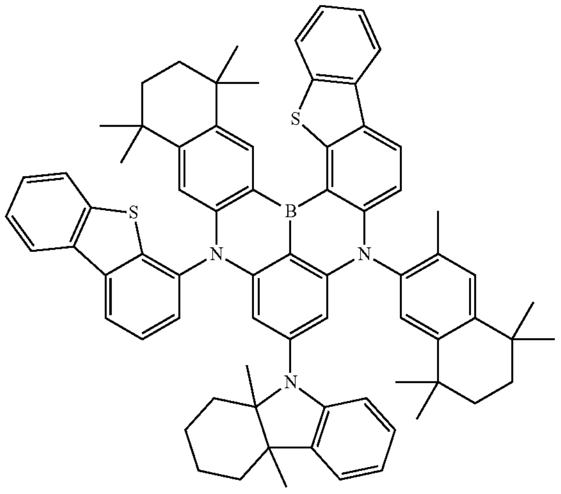
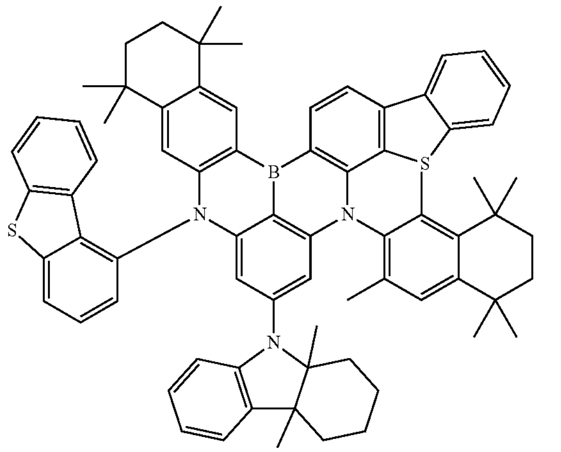
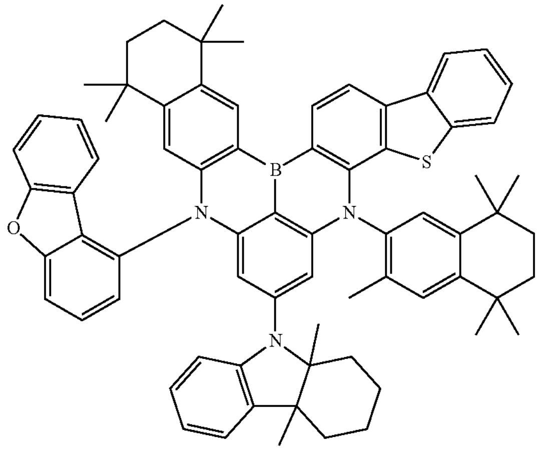
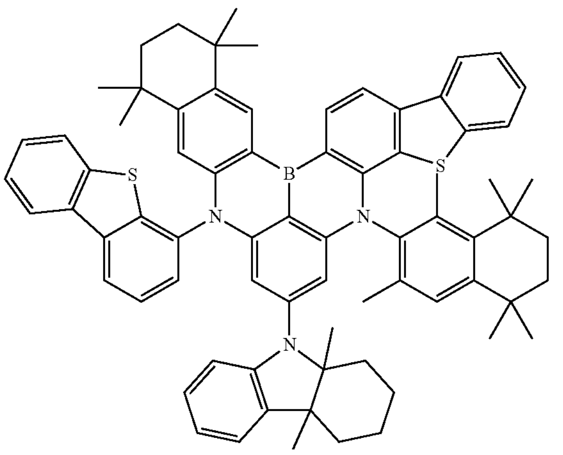
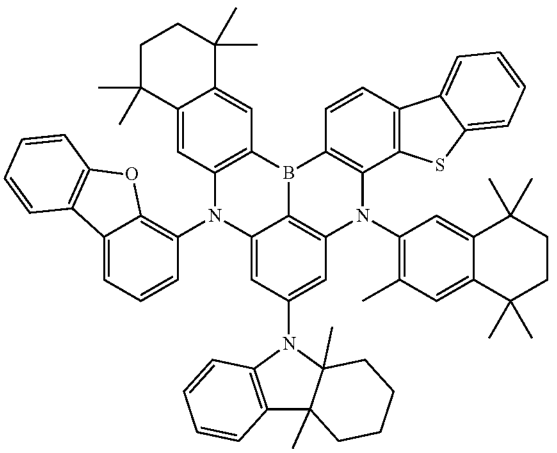
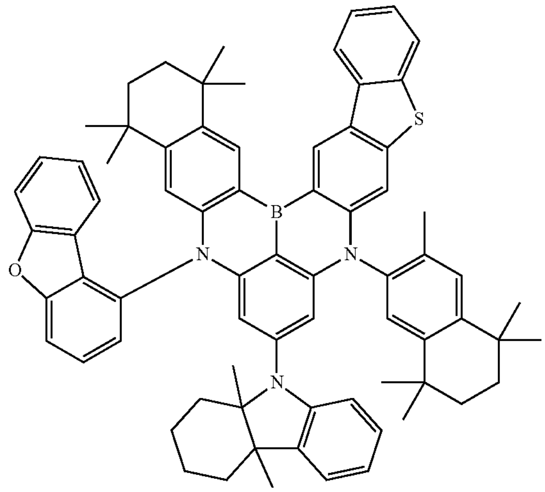
-continued -continued
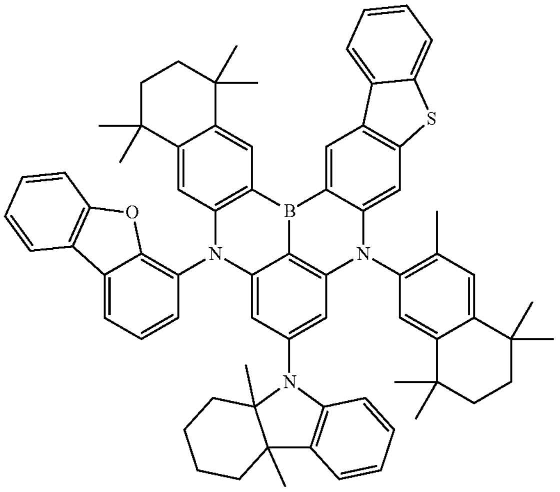
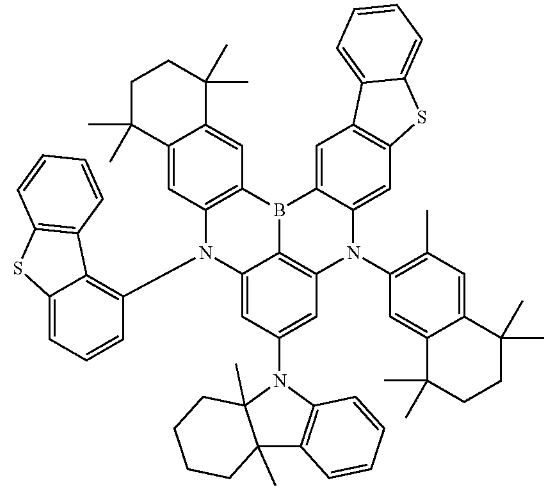
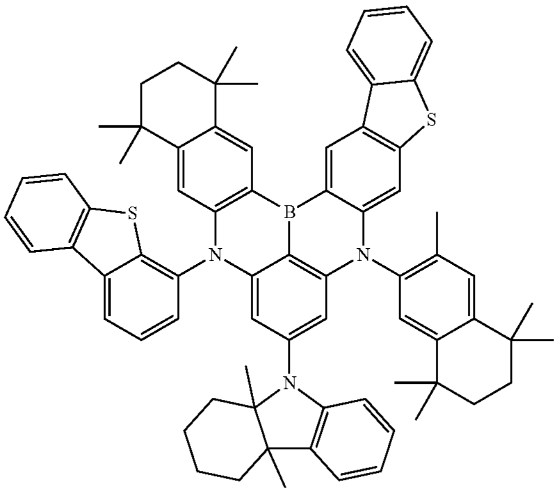
-continued
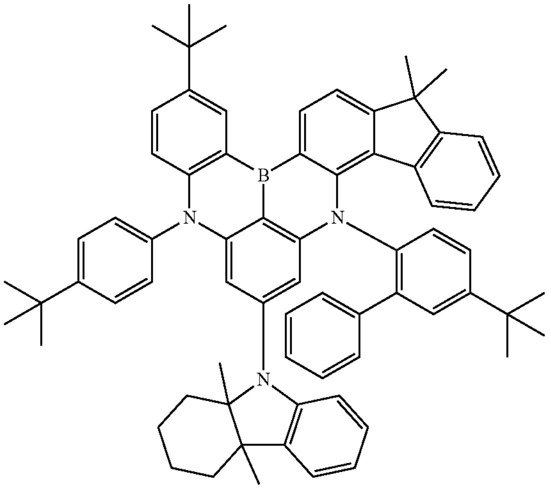
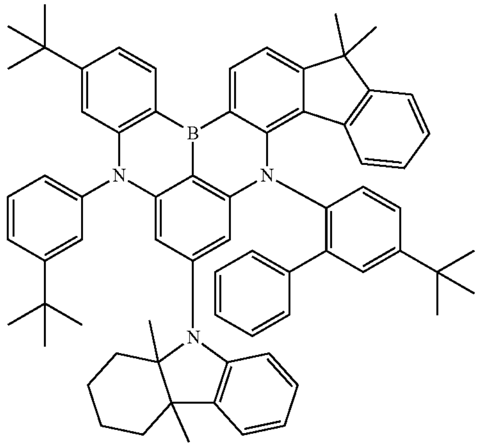
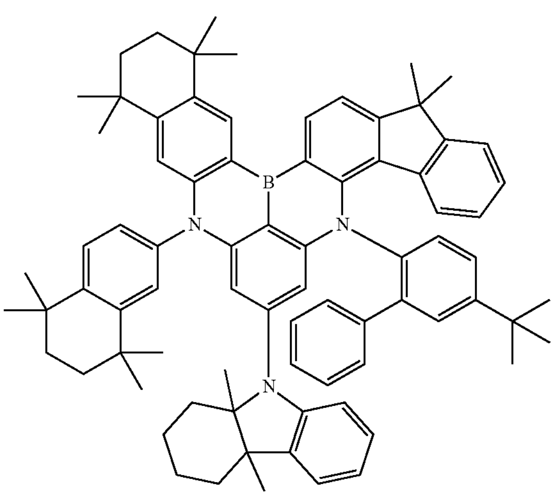

-continued
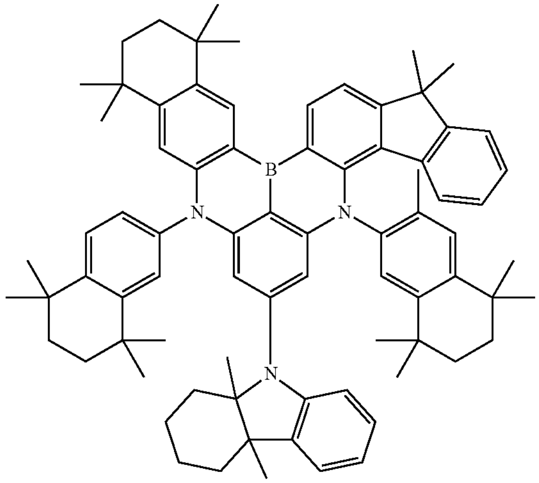
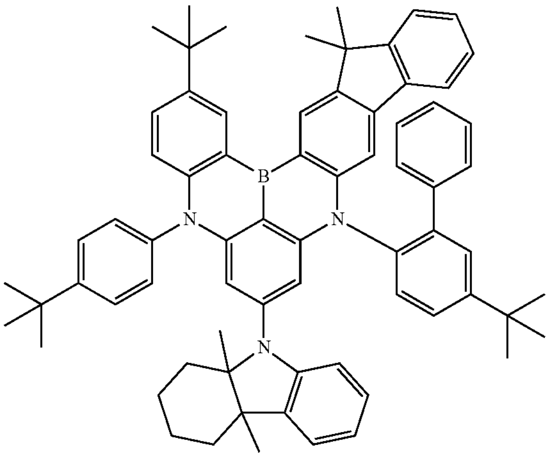
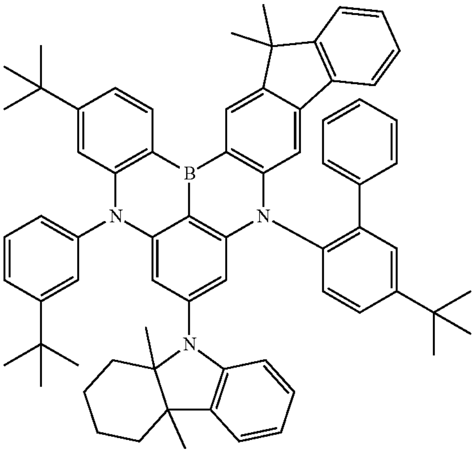
-continued
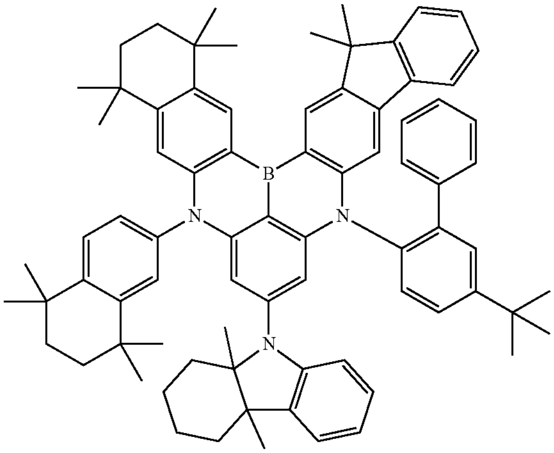
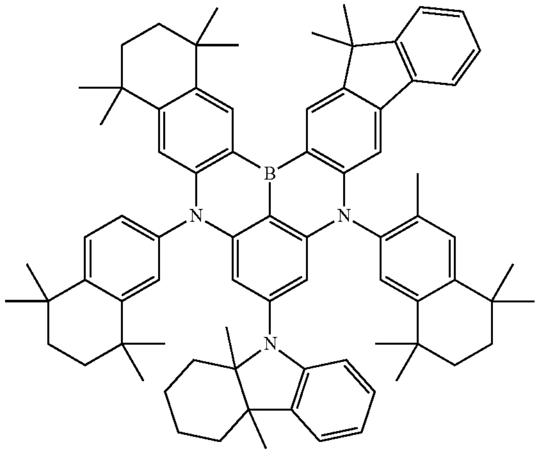
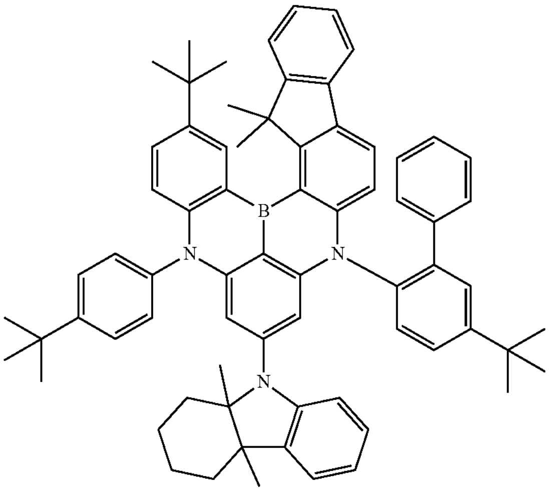

-continued
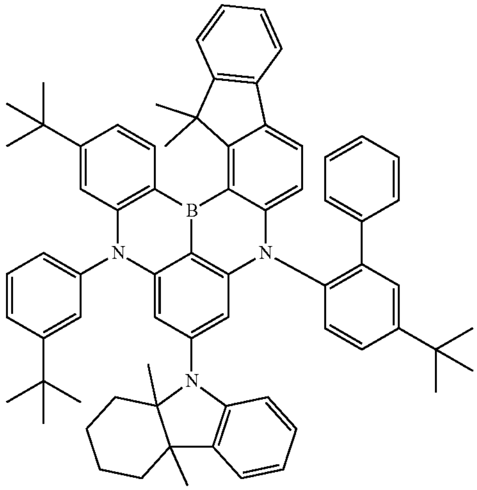
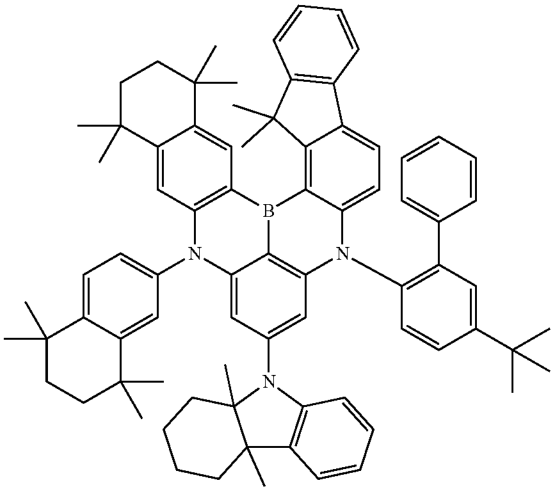
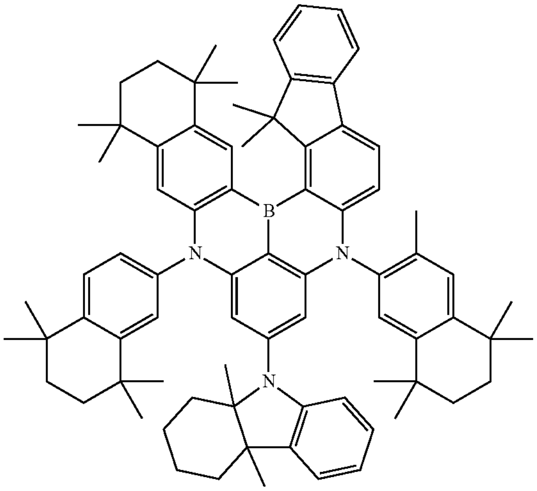
-continued
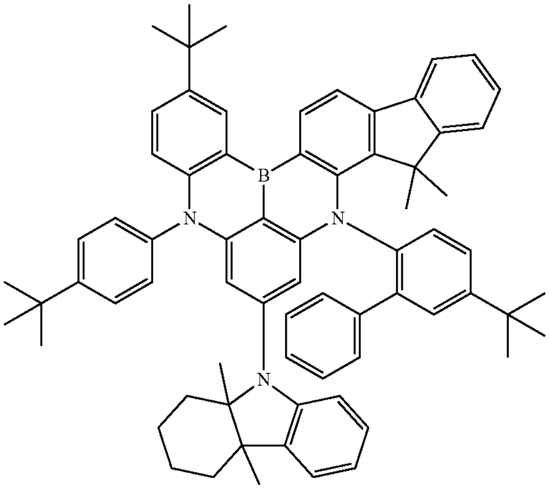
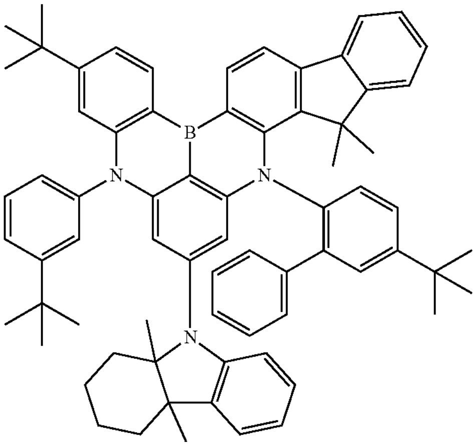
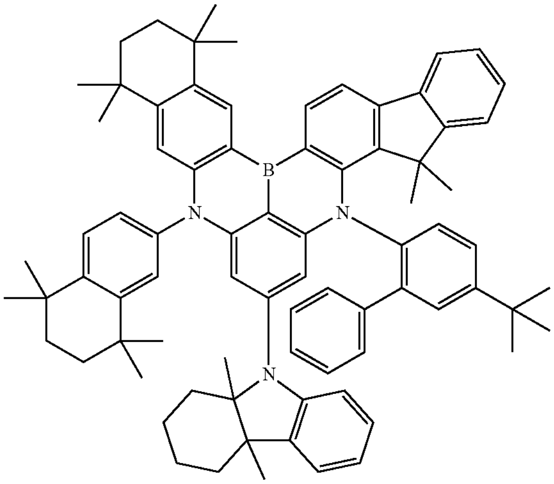

-continued
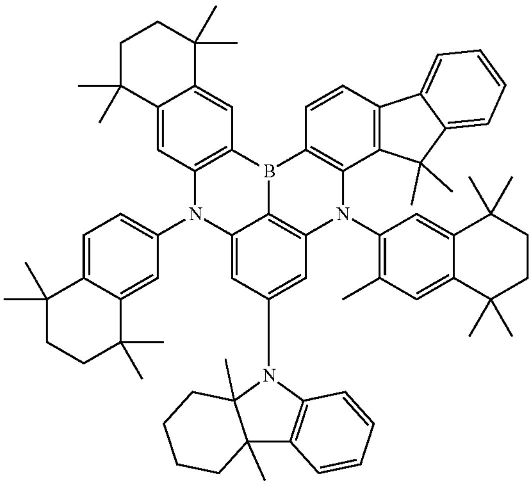
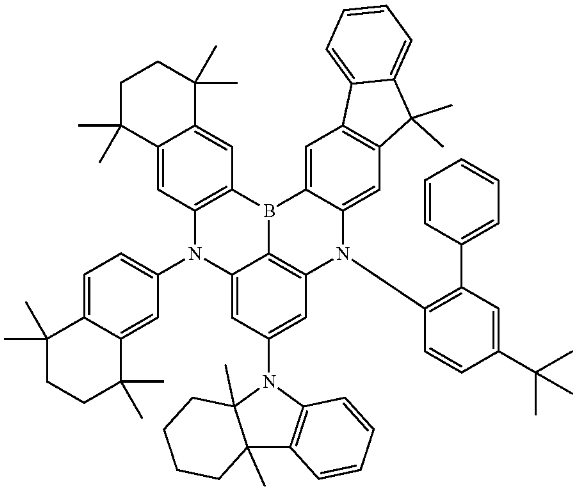
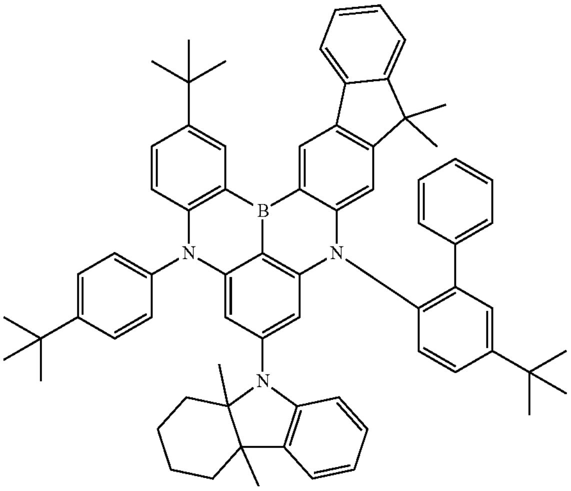
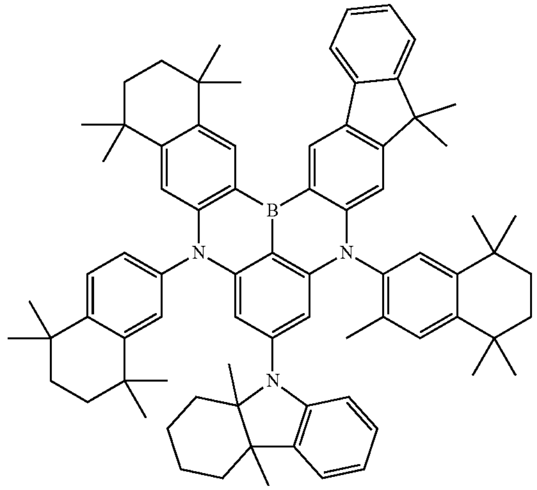
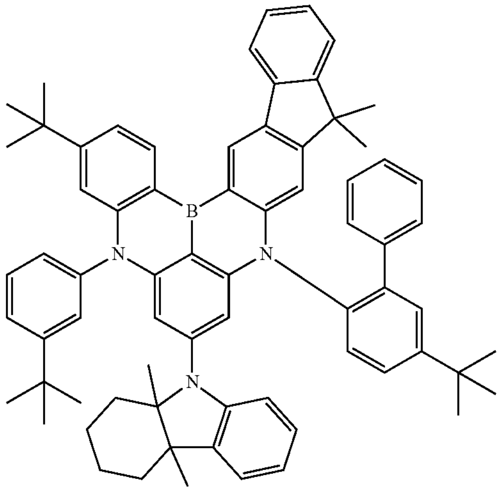
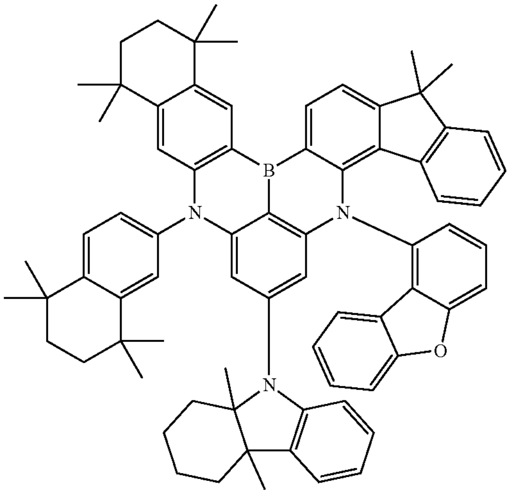
-continued

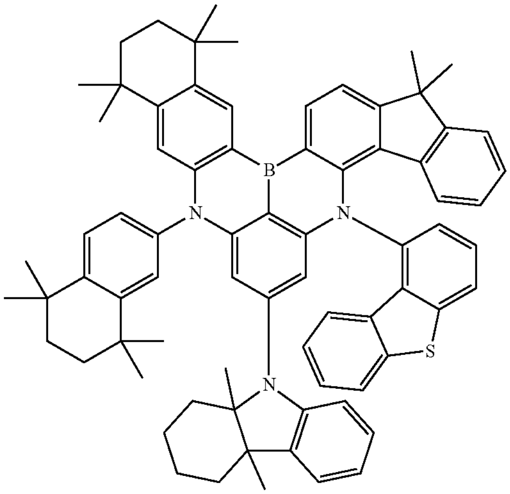
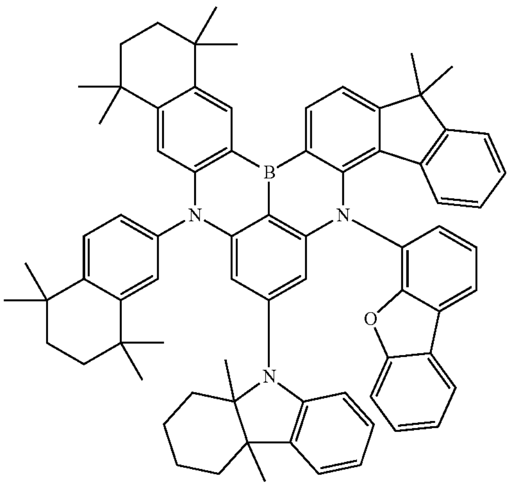
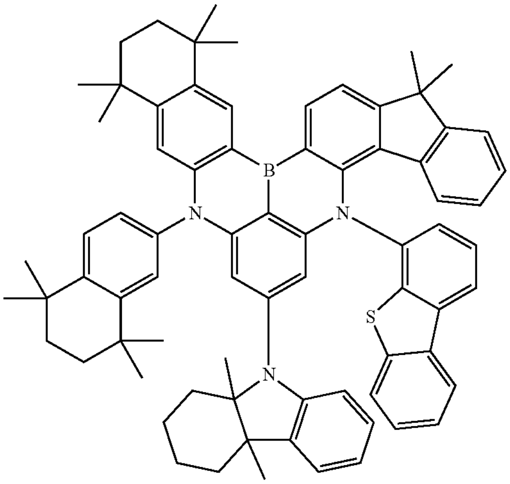
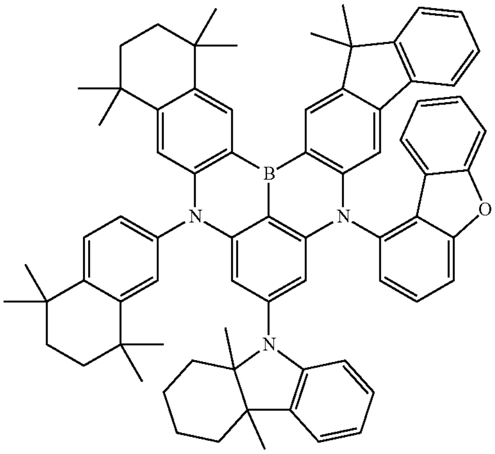
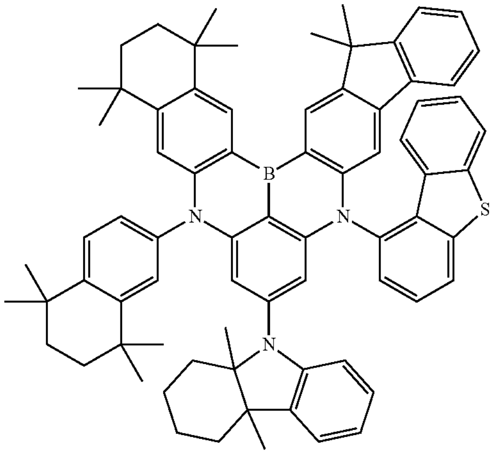
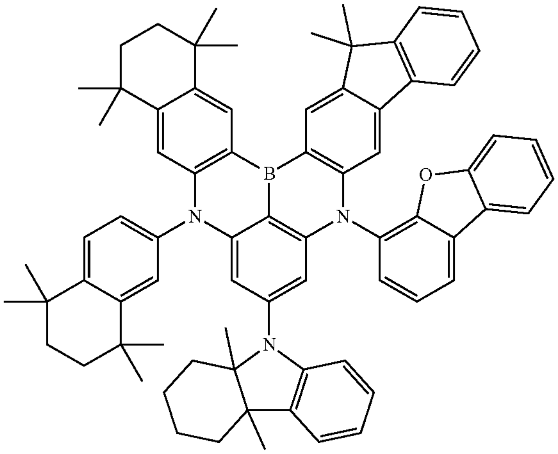

-continued
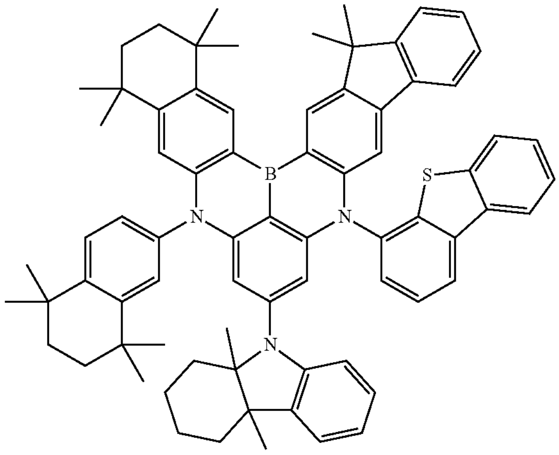
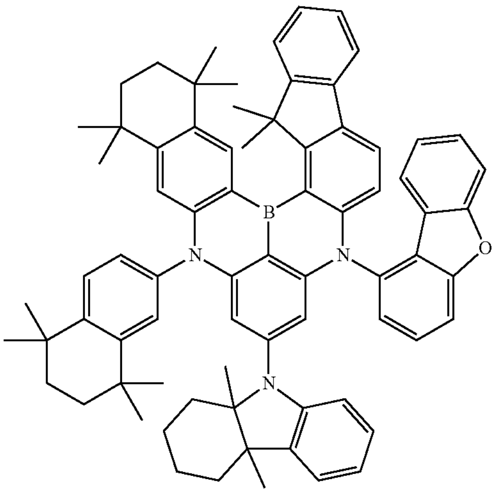
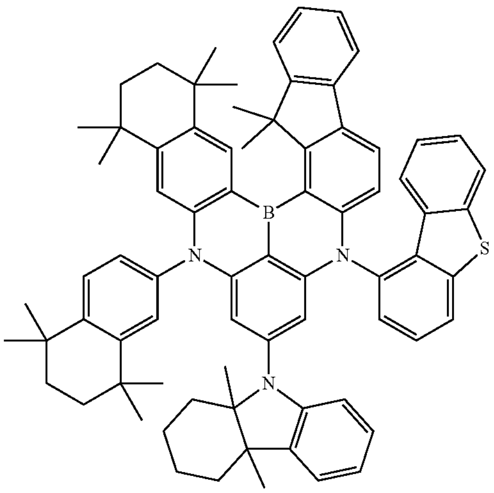
-continued
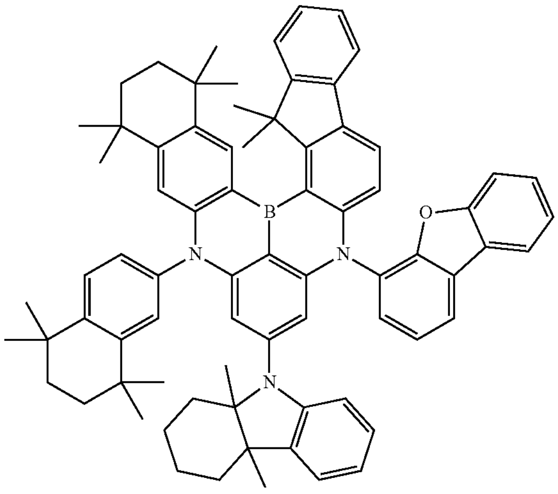
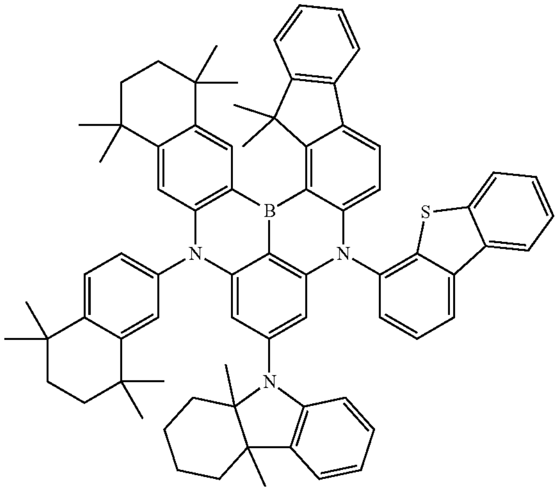
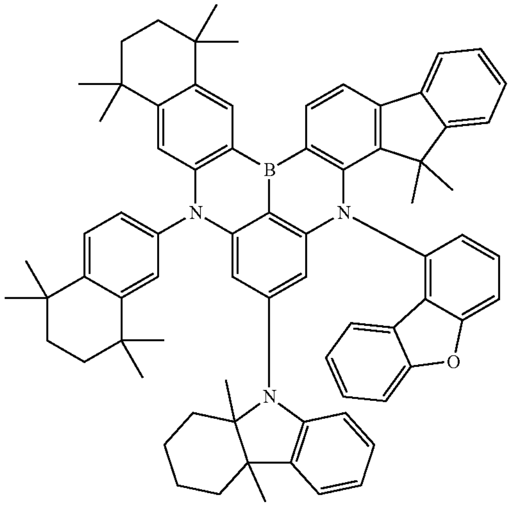

-continued
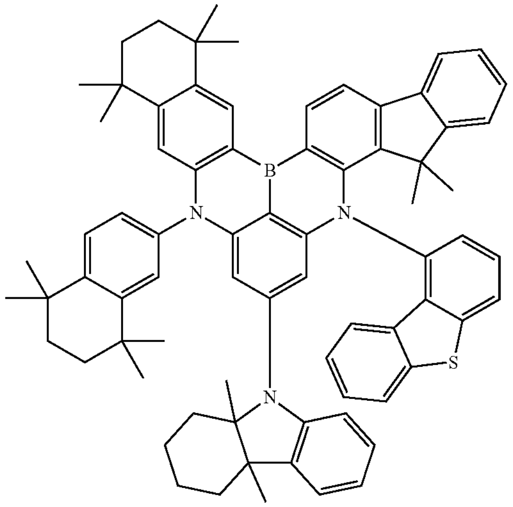
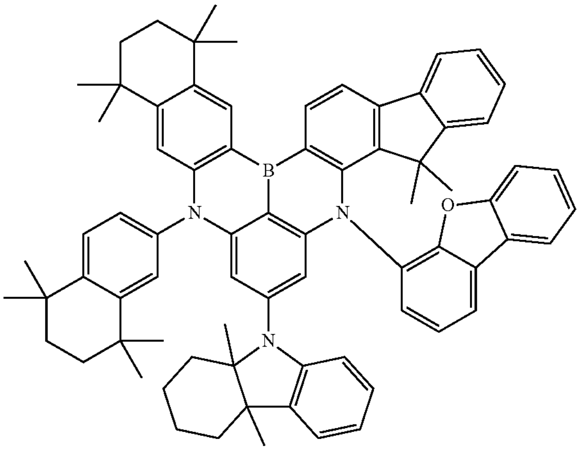
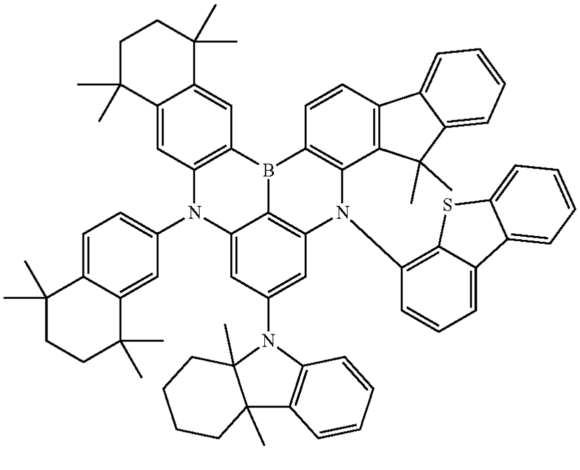
-continued
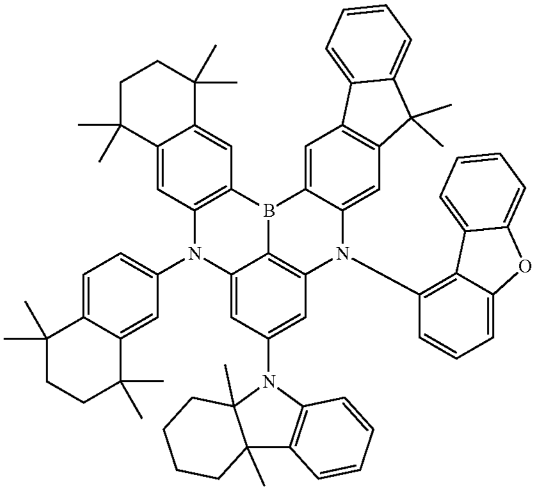
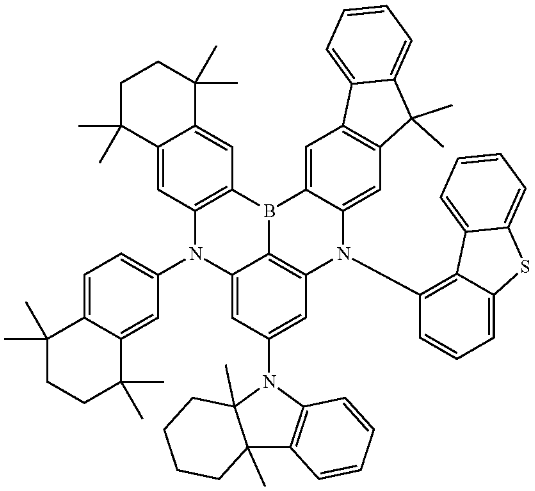
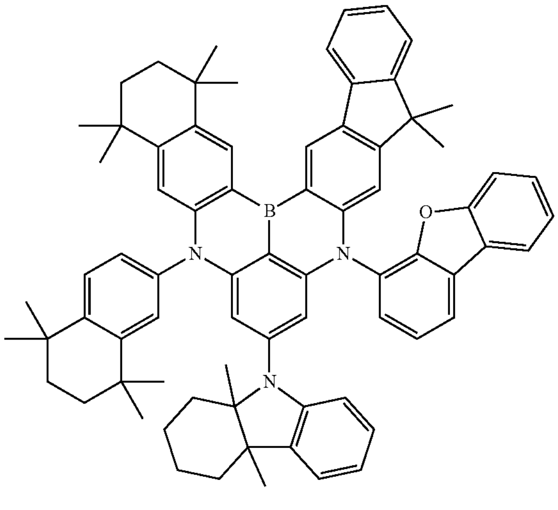

-continued
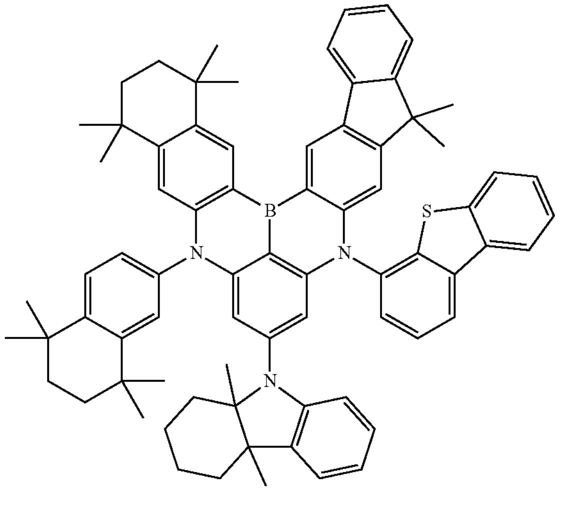
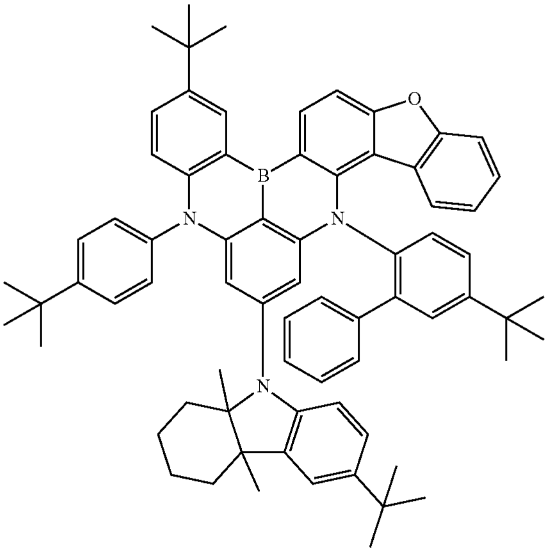
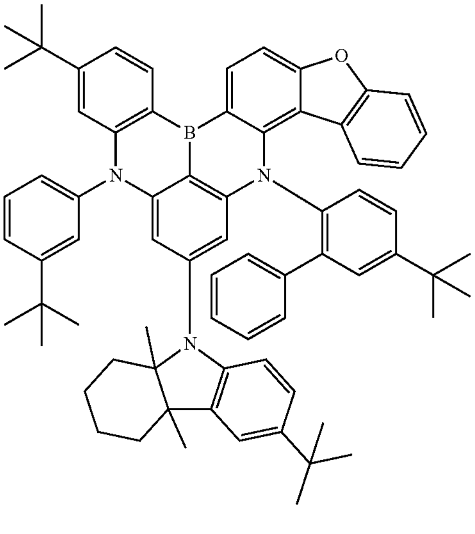
-continued
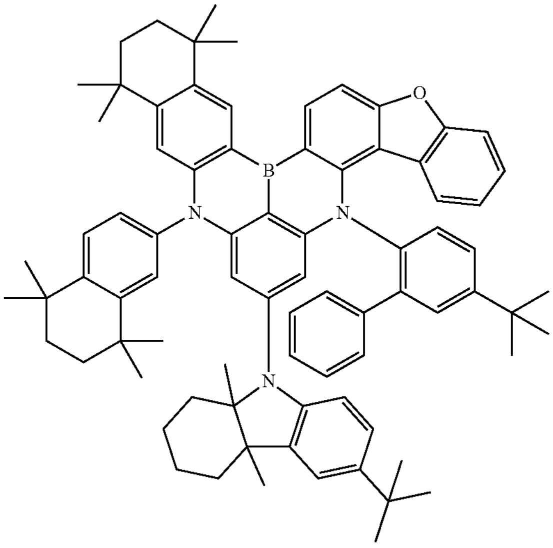
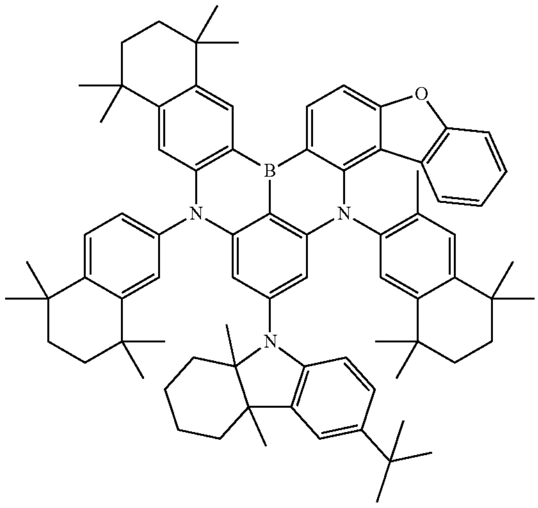
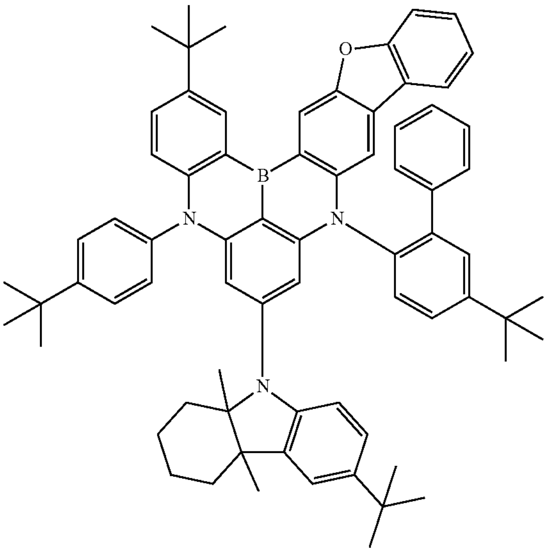

-continued
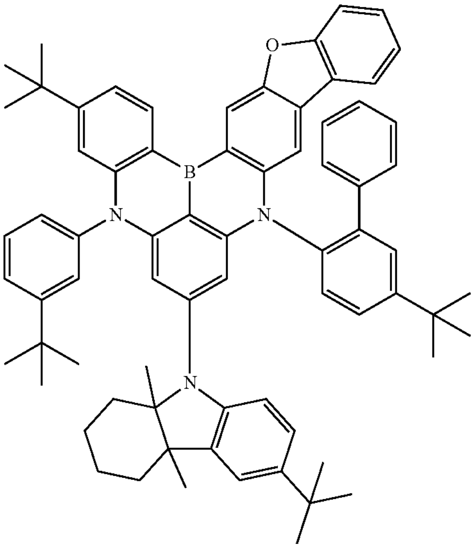
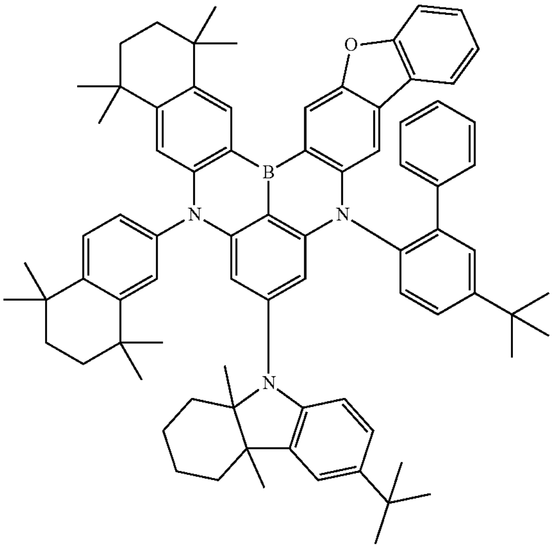
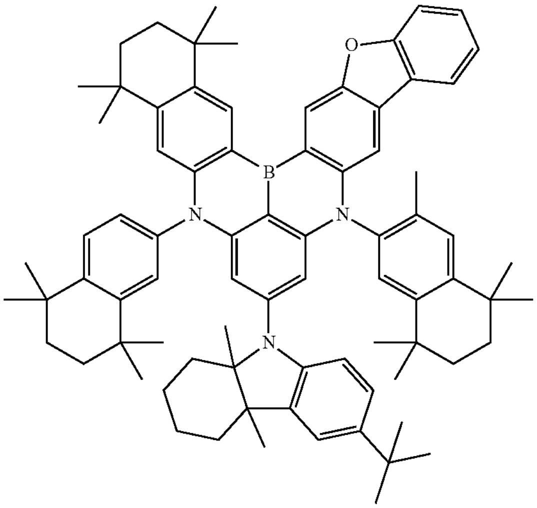
-continued
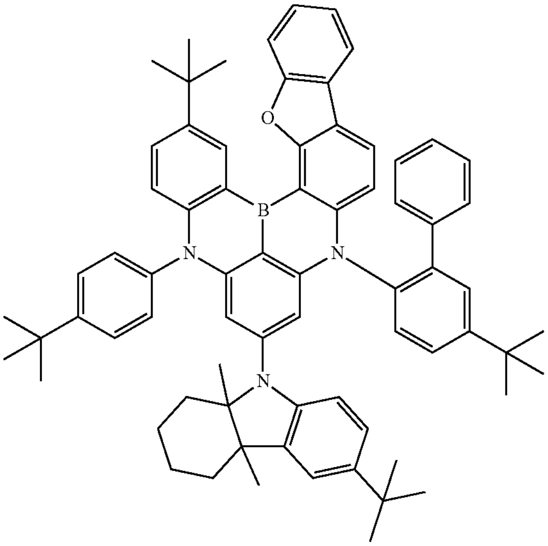
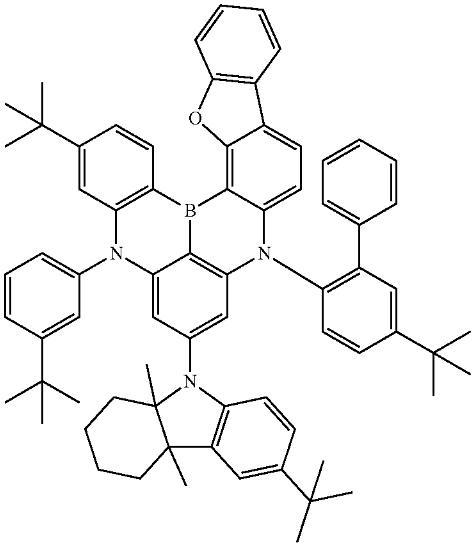
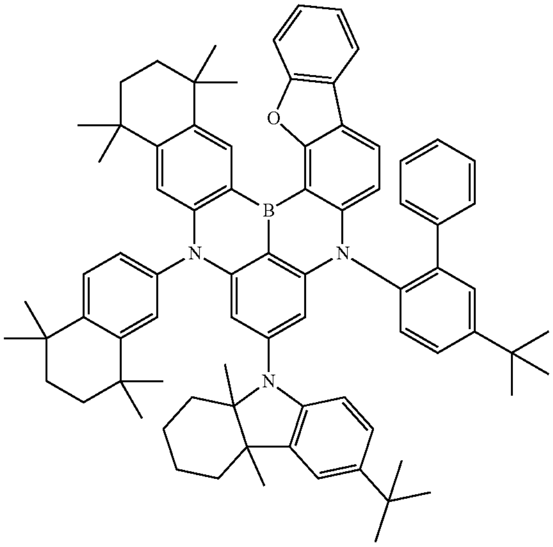

-continued
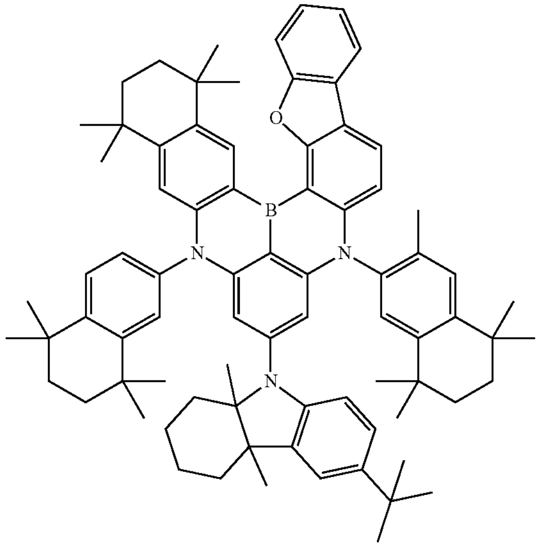
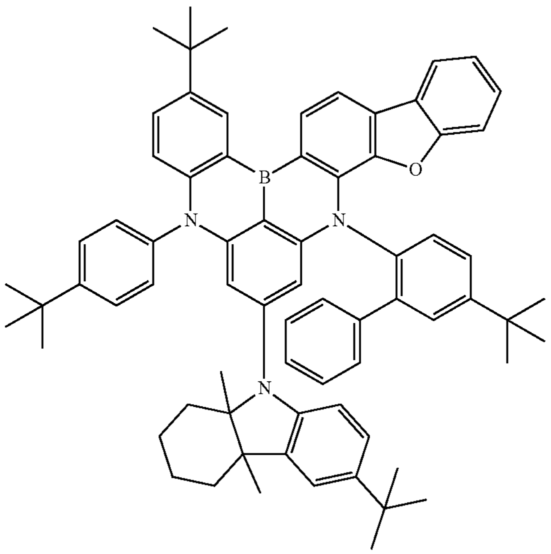
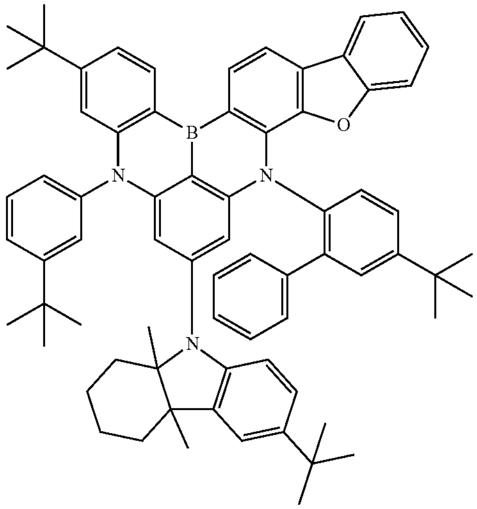
-continued
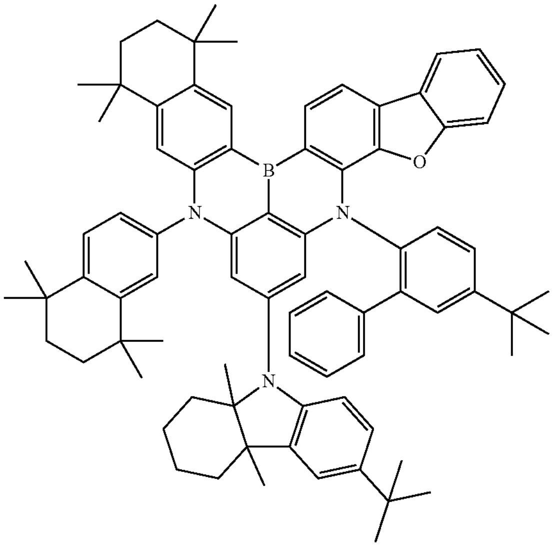
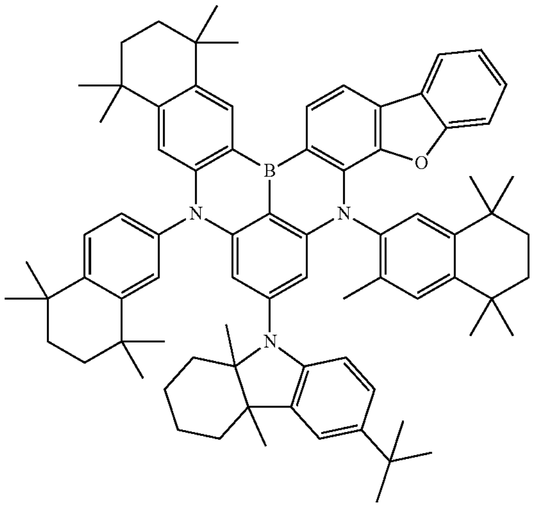
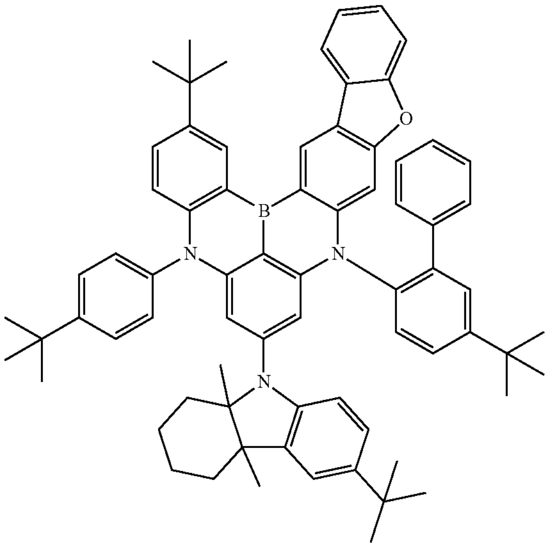

-continued
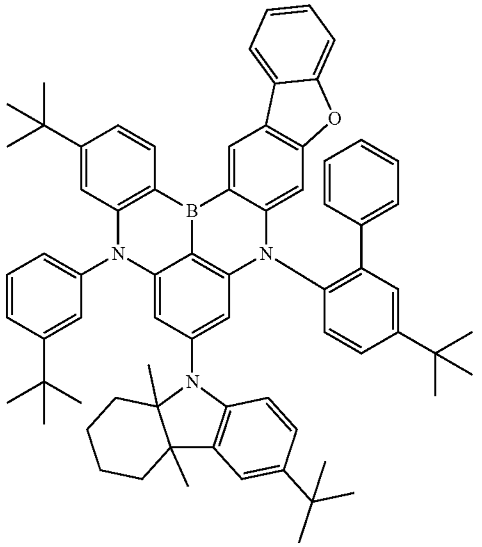
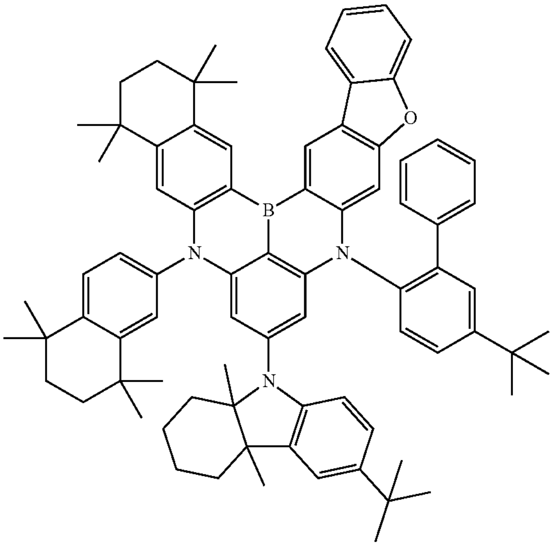
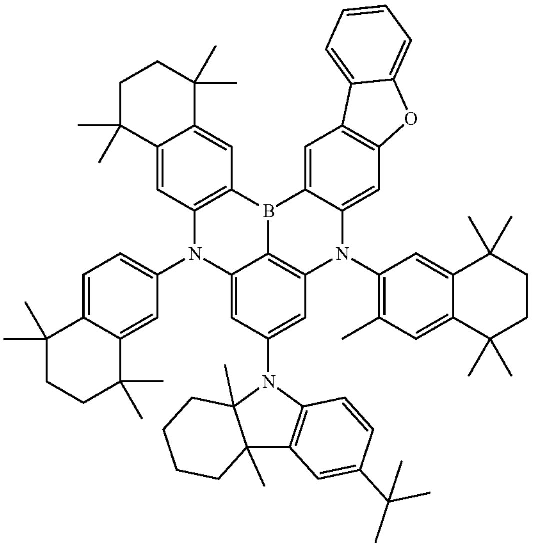
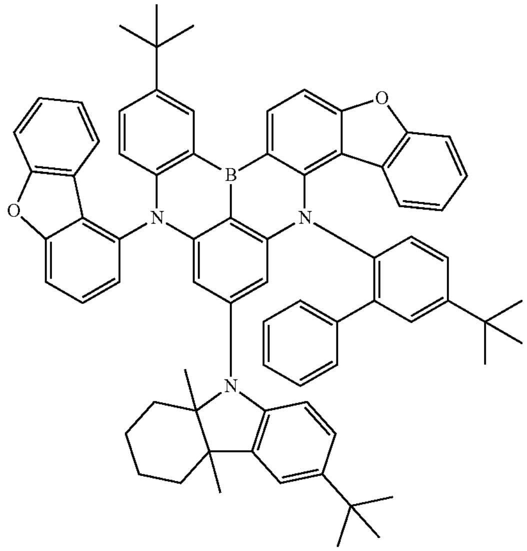
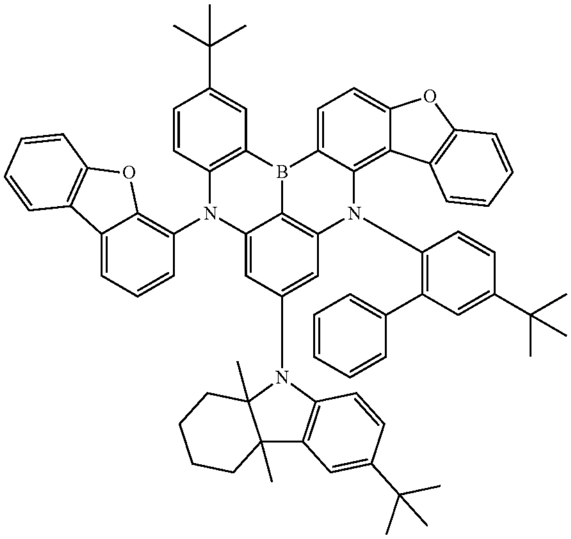
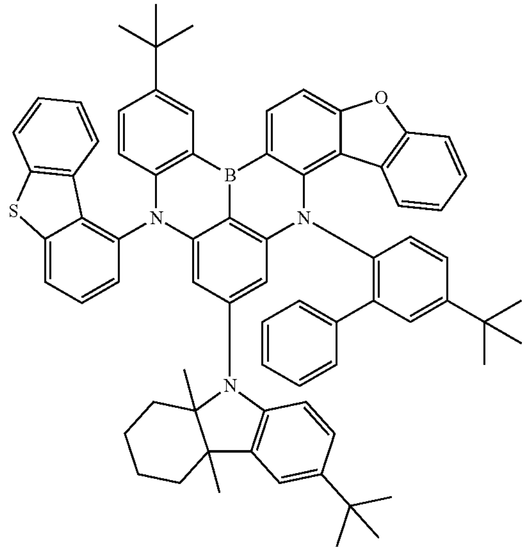

-continued
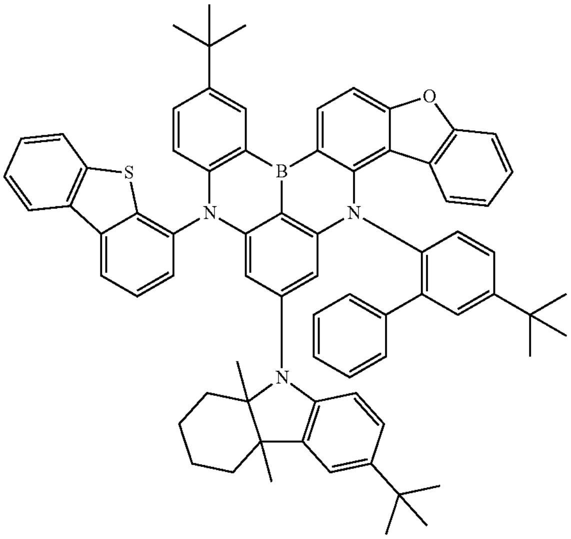
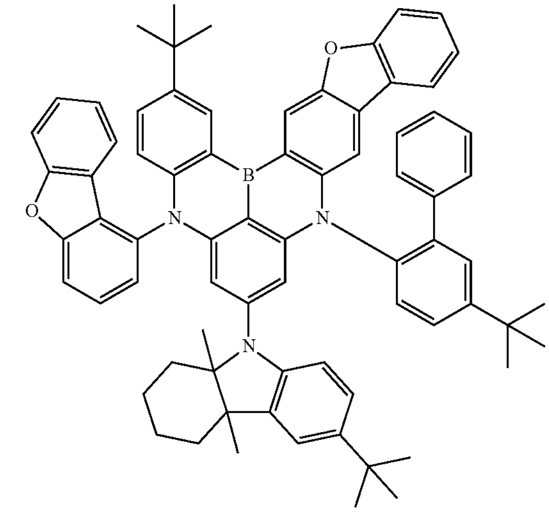
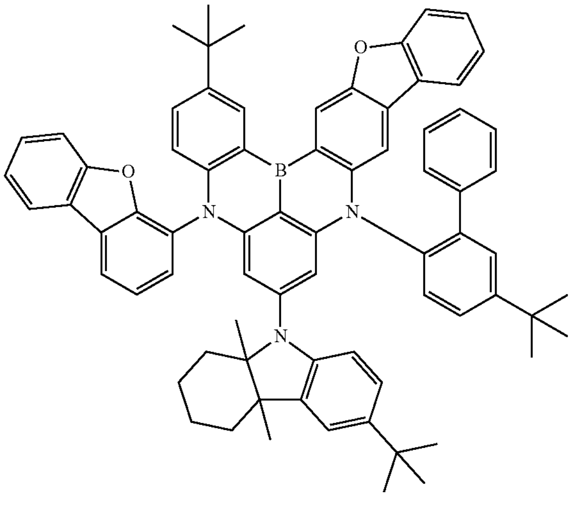
-continued
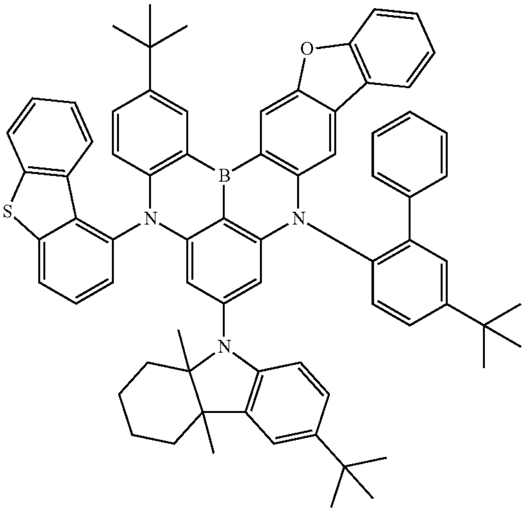
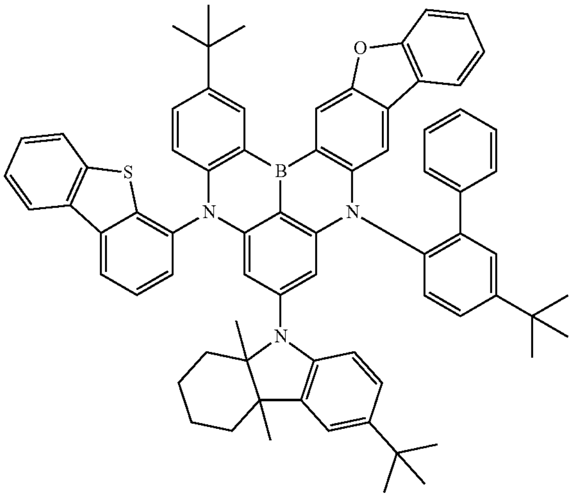
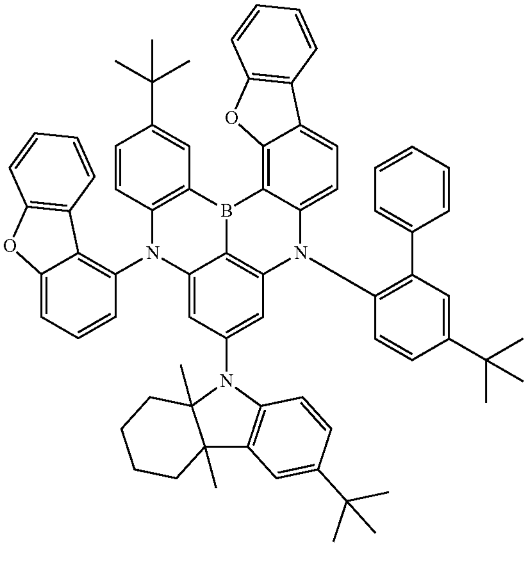

-continued
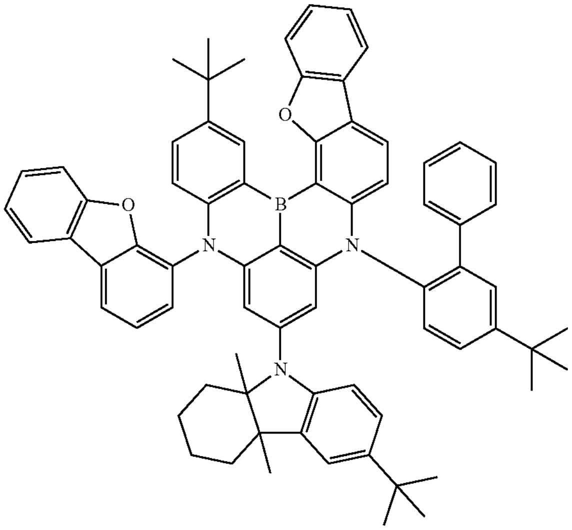
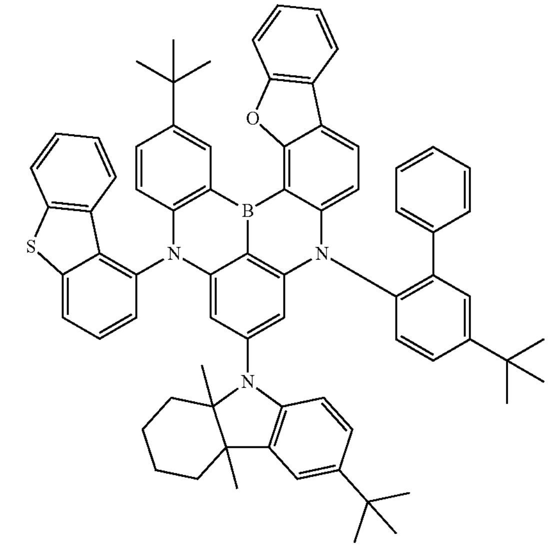
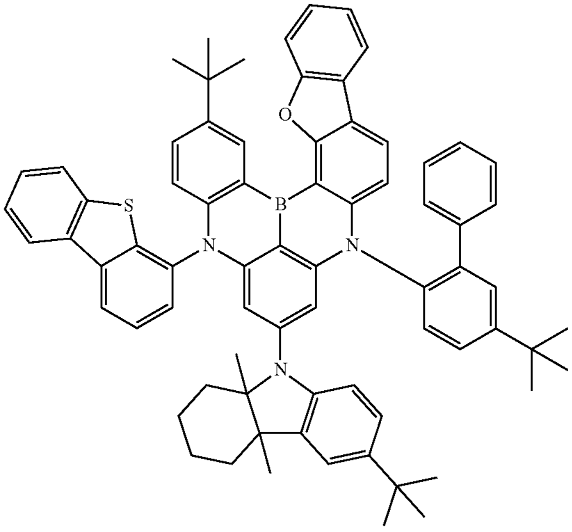
-continued
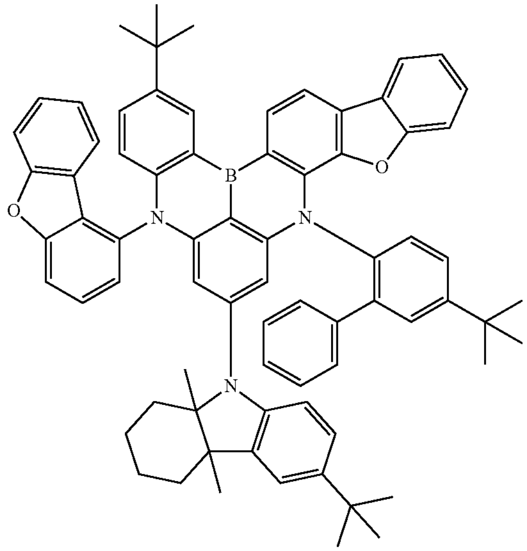
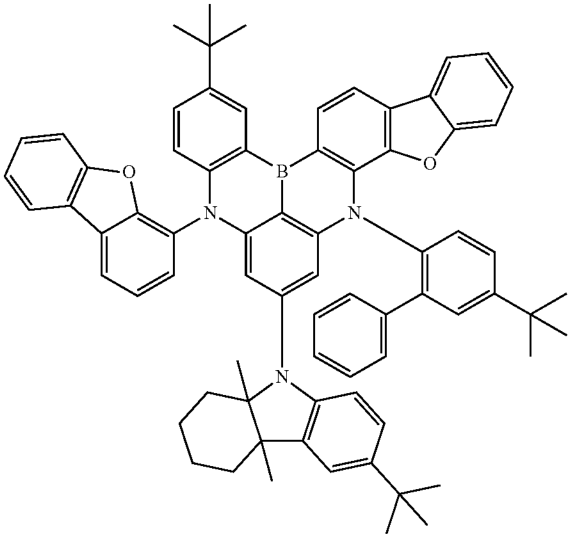
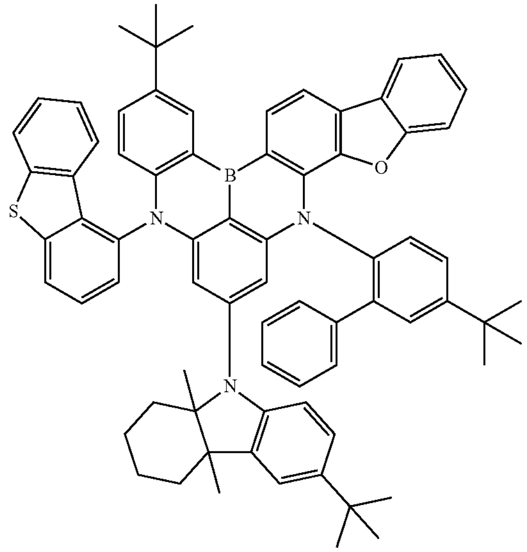

-continued
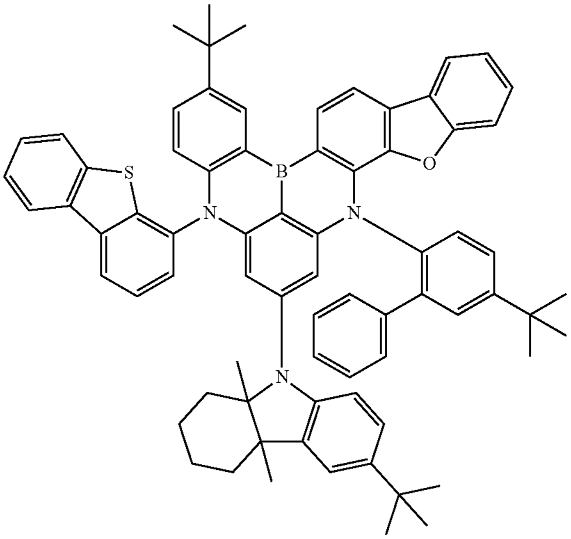
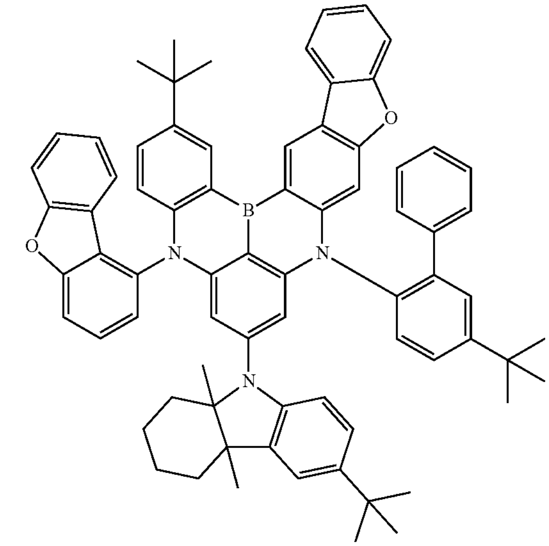
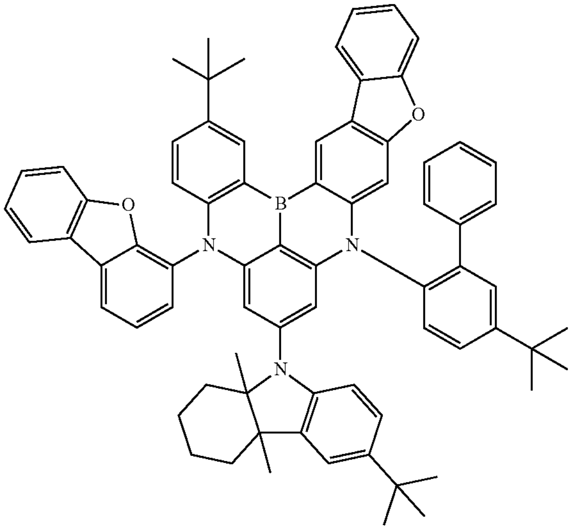
-continued
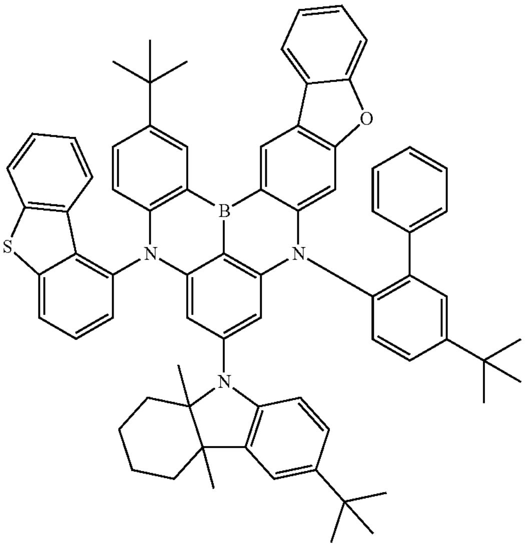
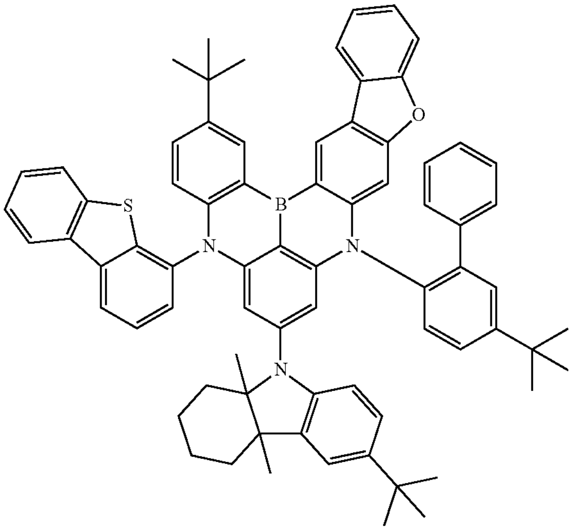
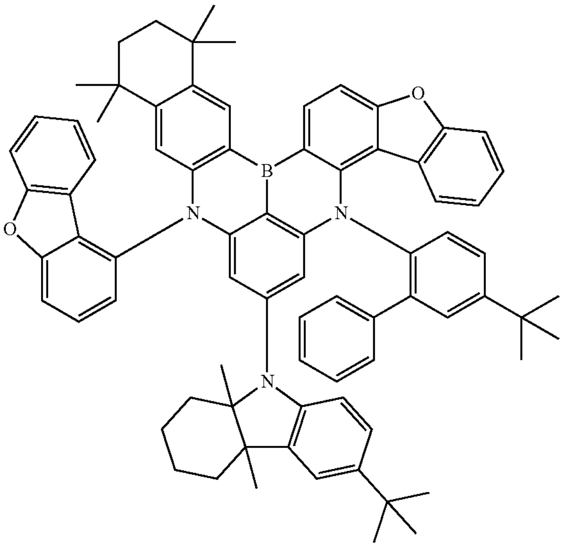

-continued
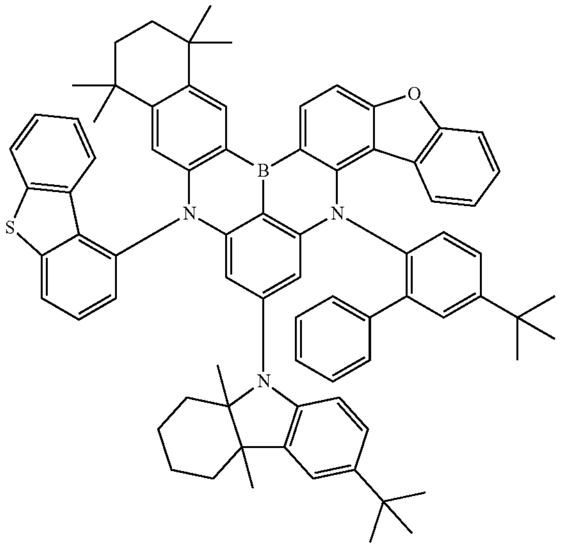
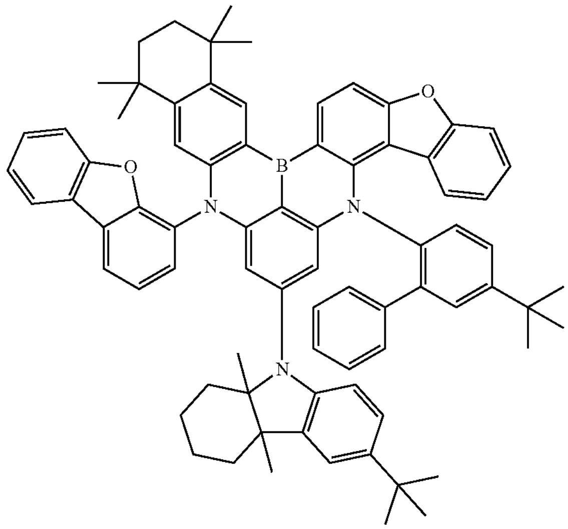
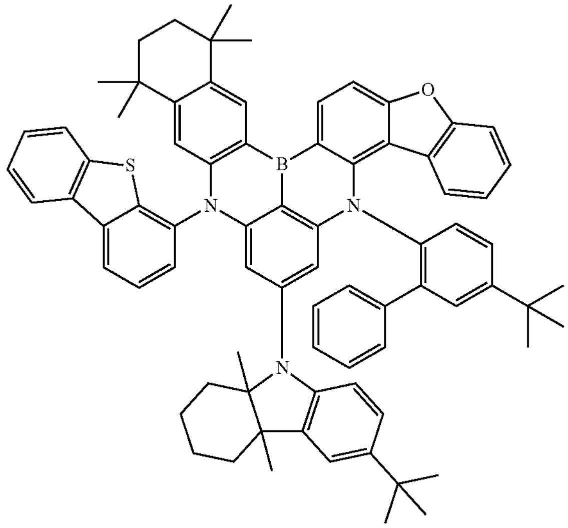
-continued
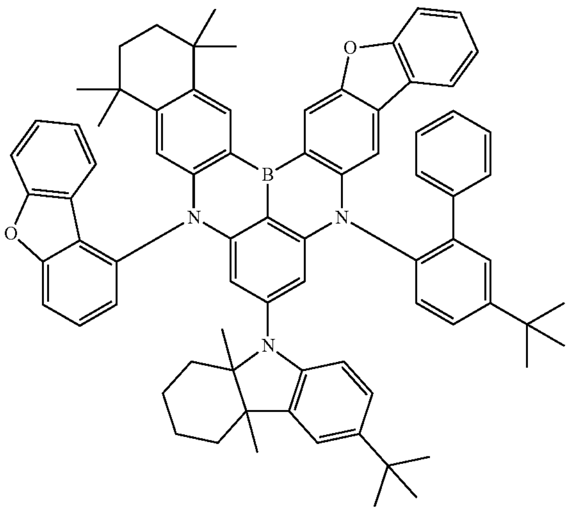
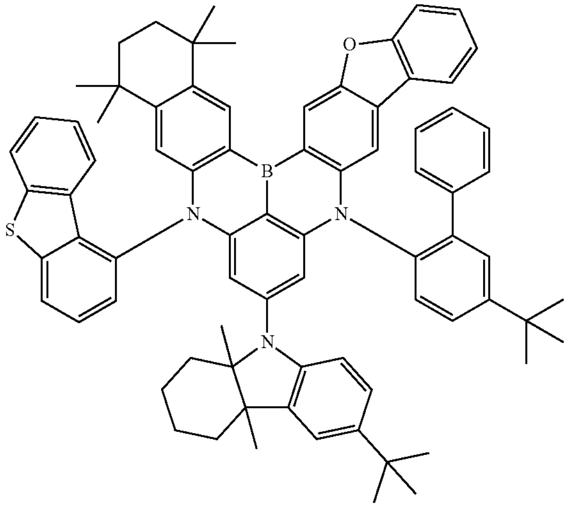
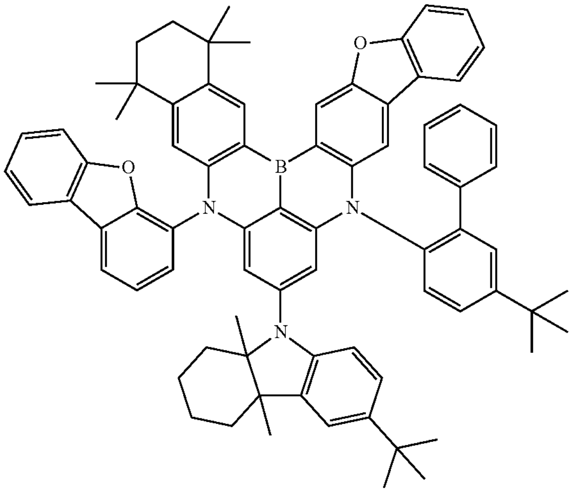

-continued
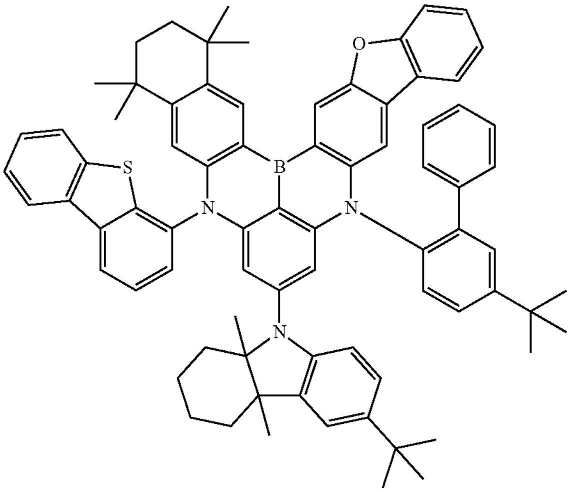
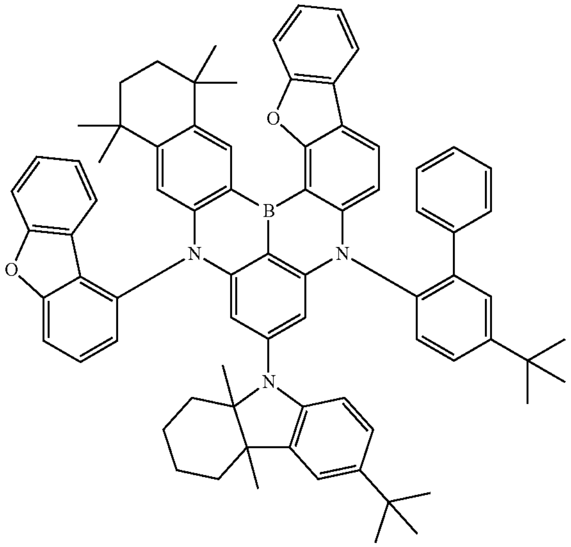
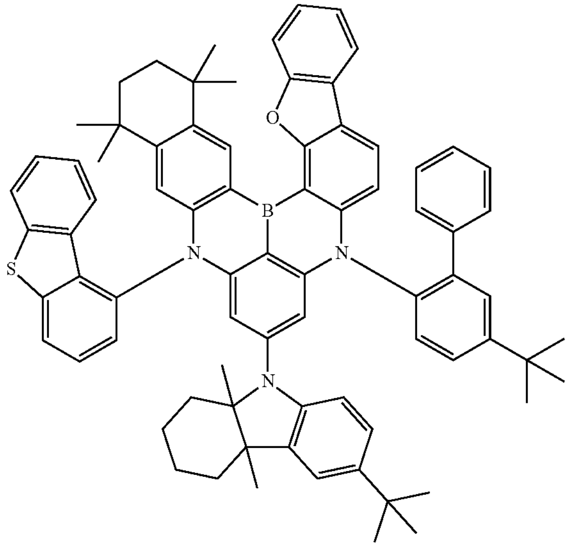
-continued
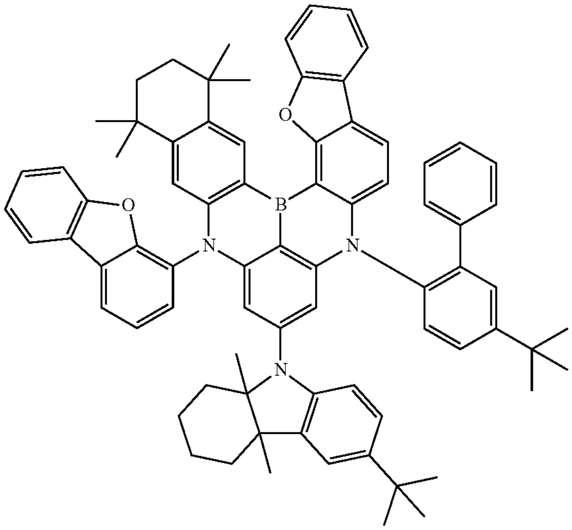
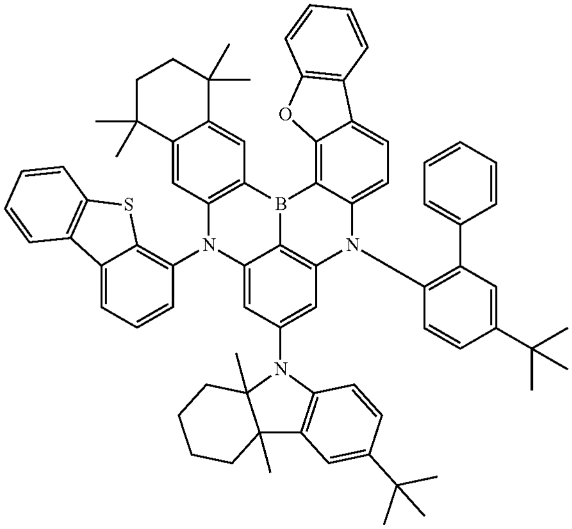
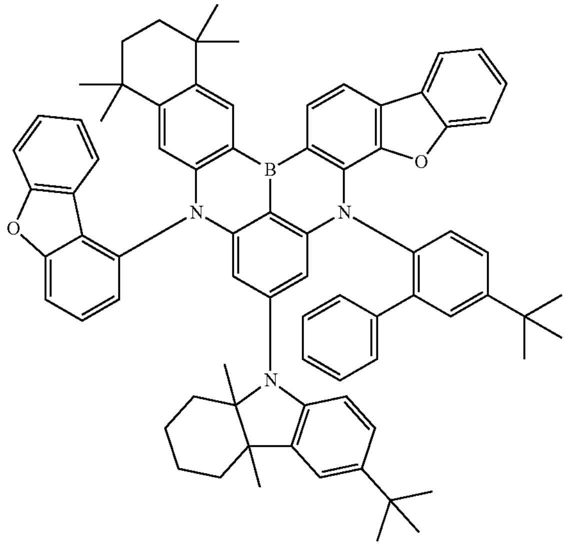

-continued
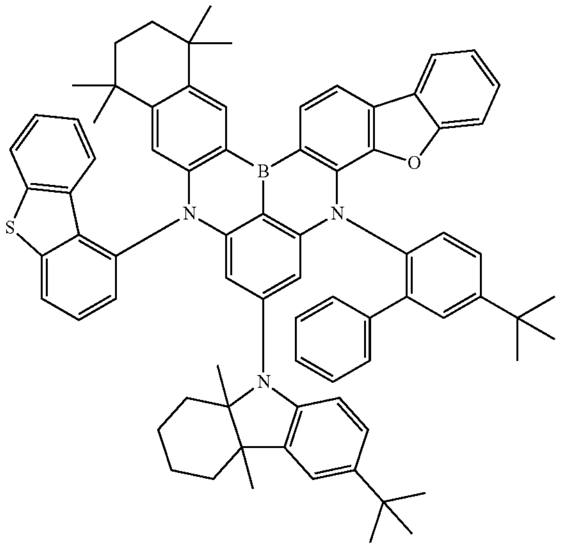
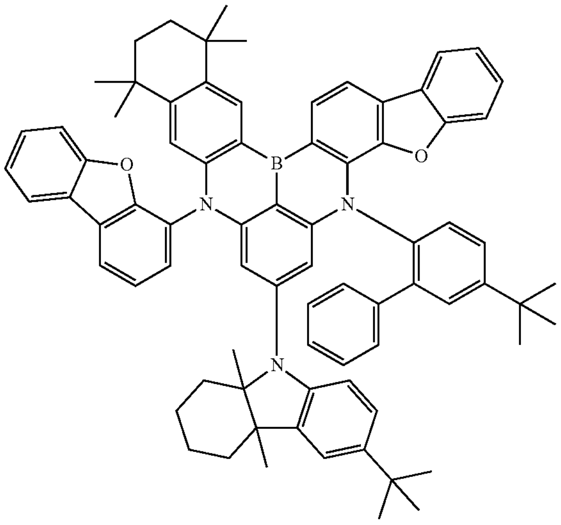
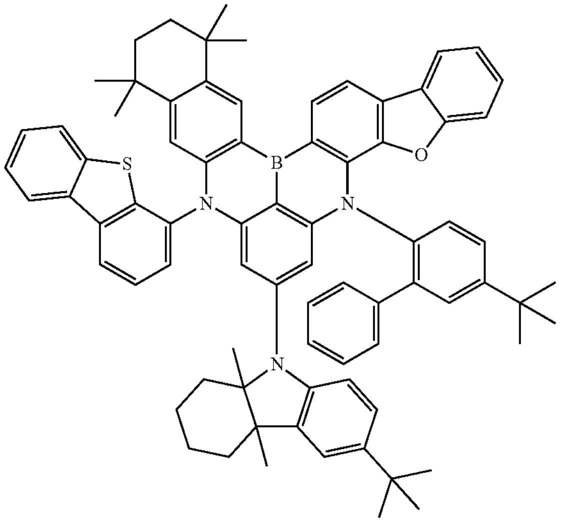
-continued
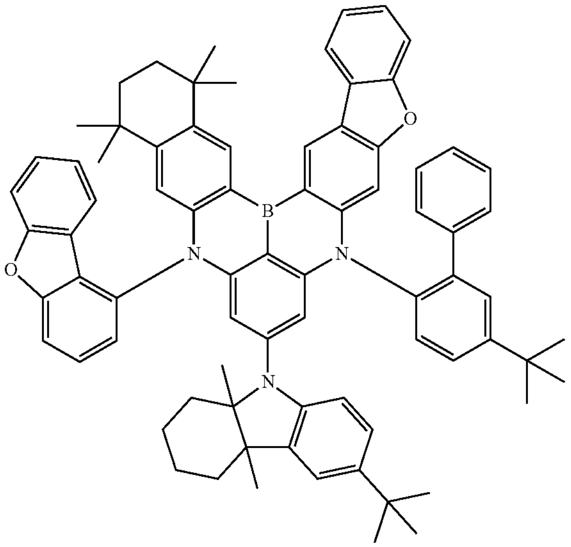
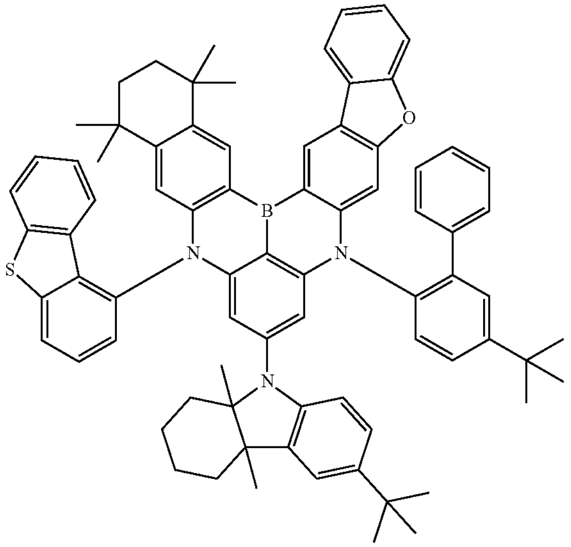
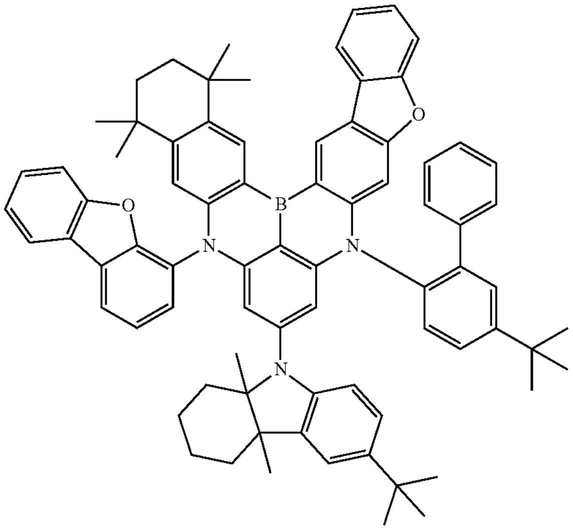

-continued
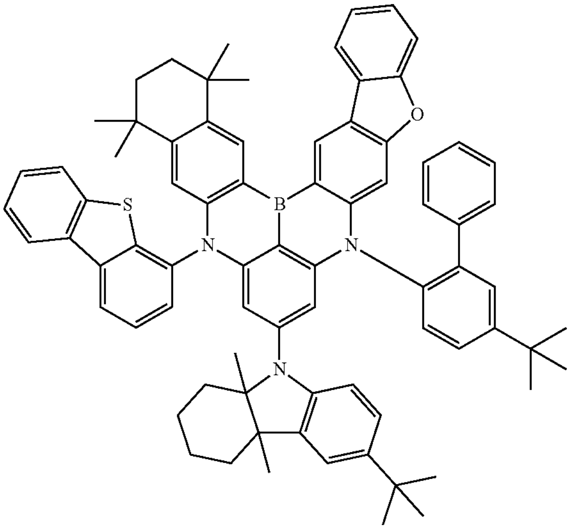
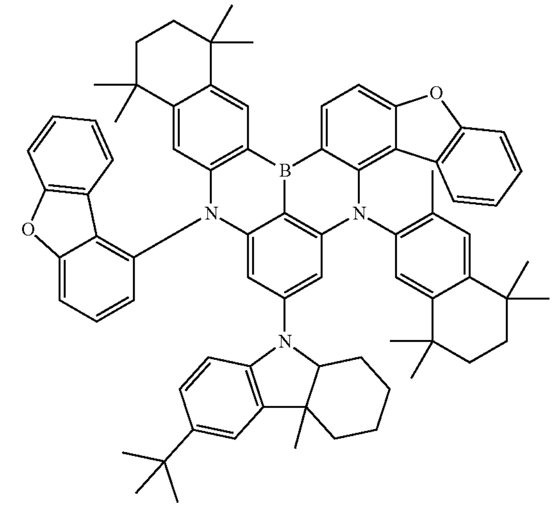
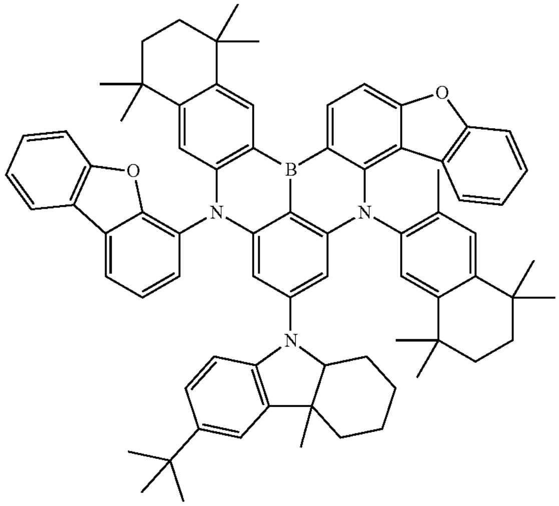
-continued
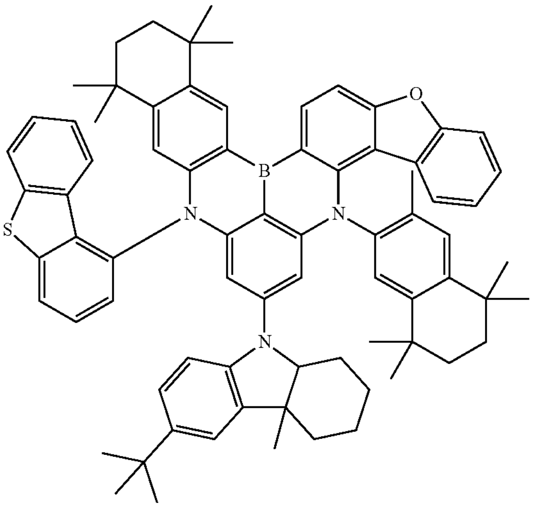
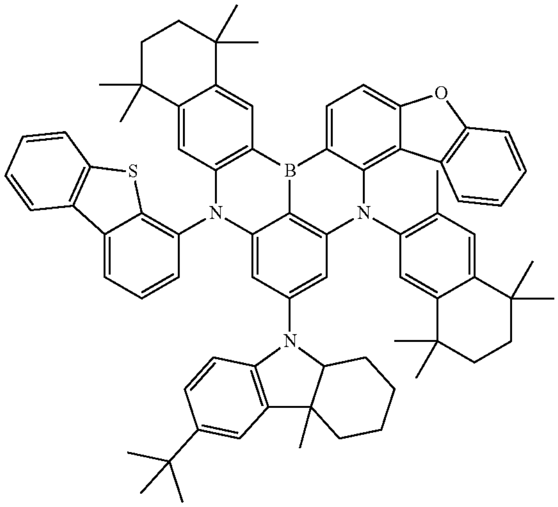
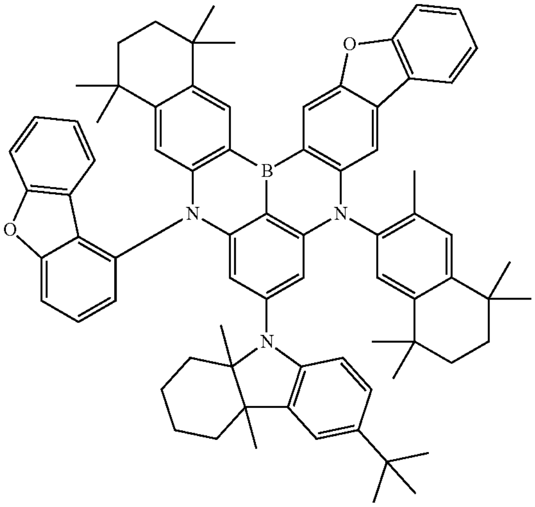

-continued
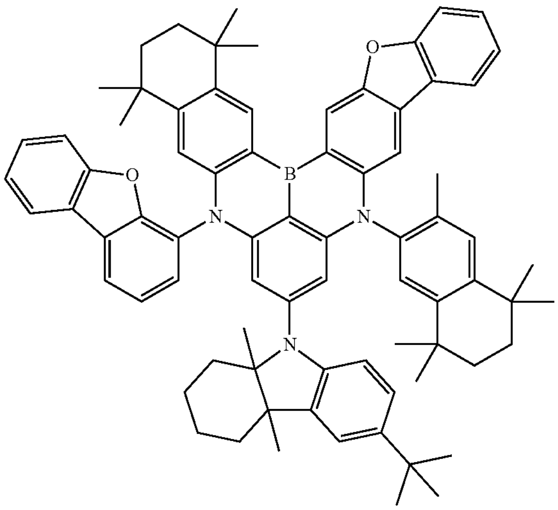
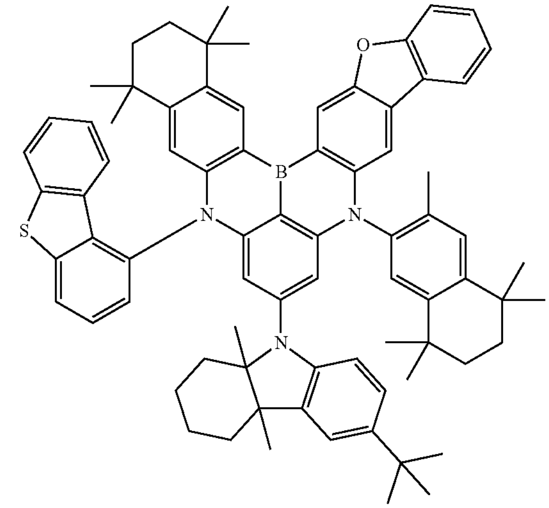
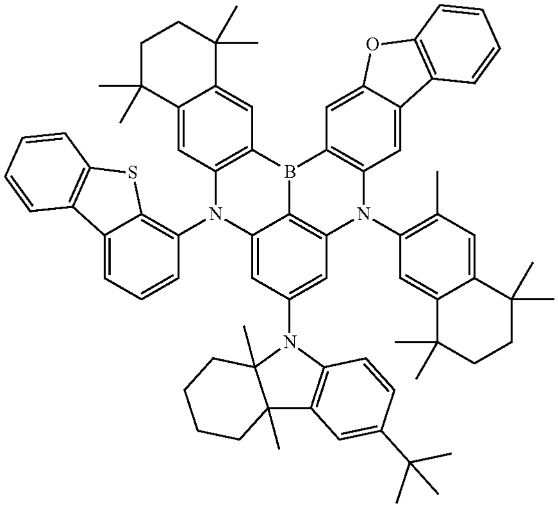
-continued
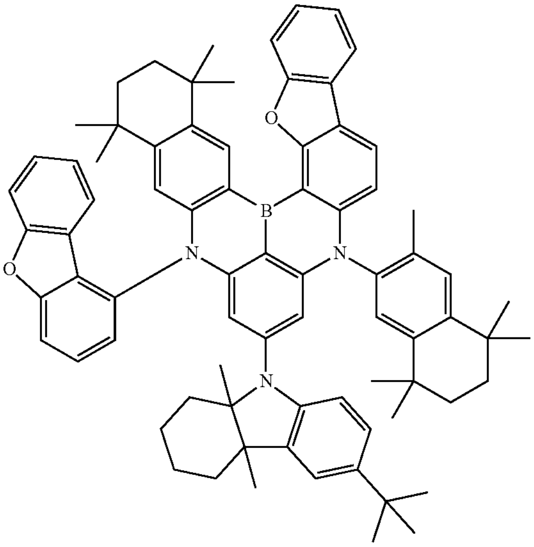
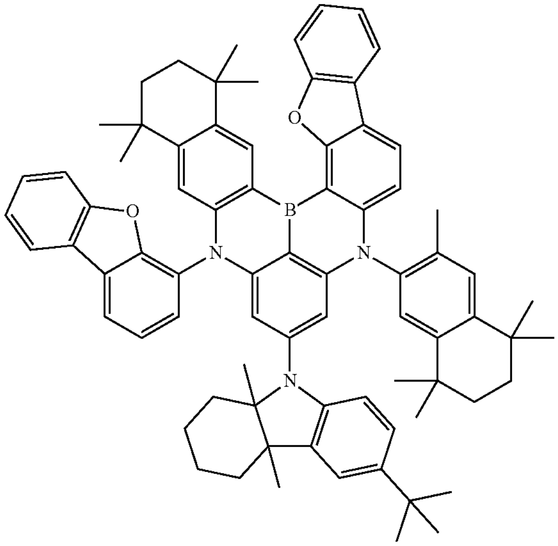
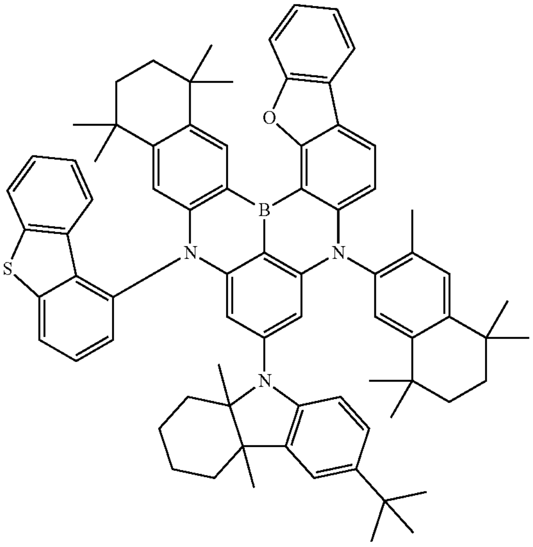

-continued
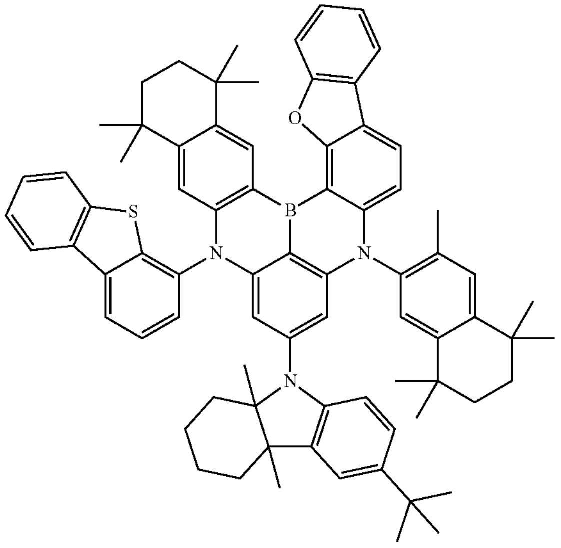
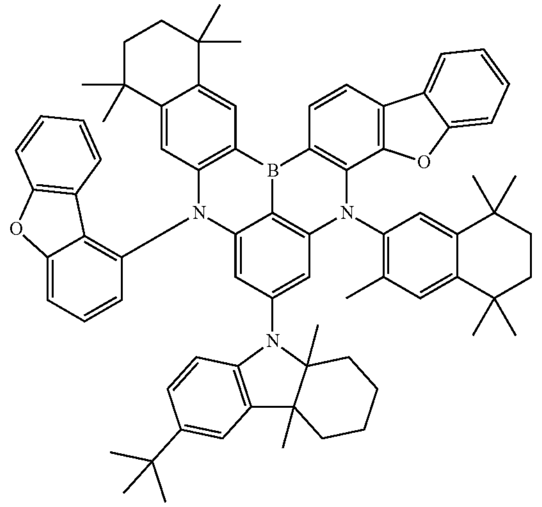
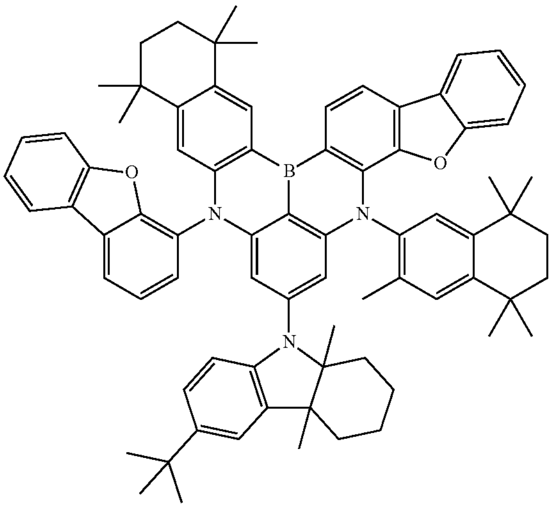
-continued
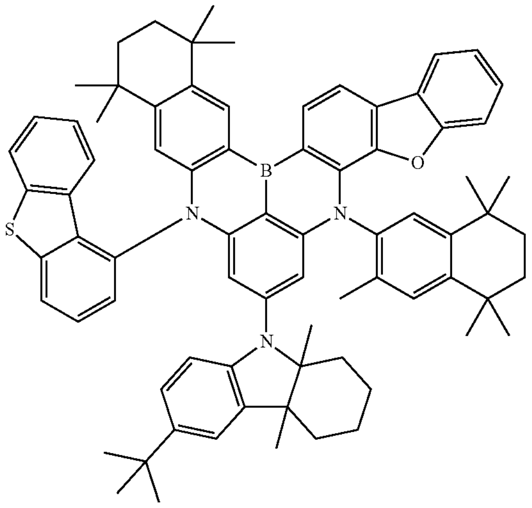
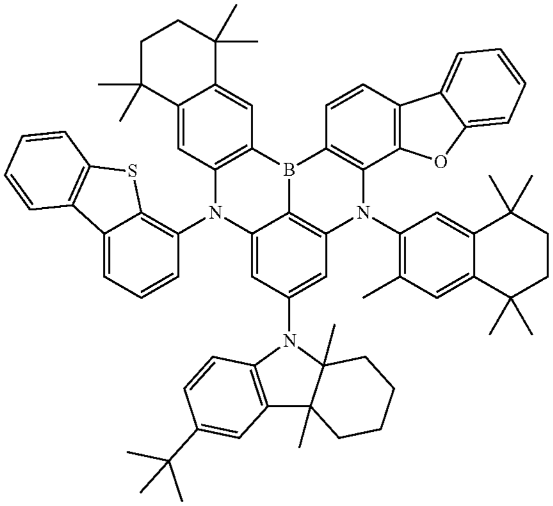
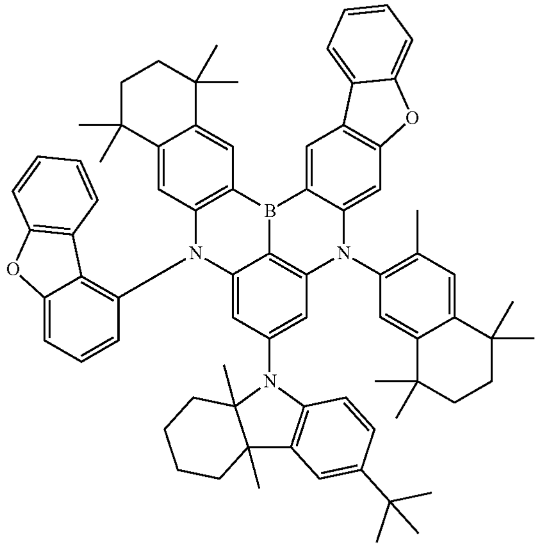

-continued
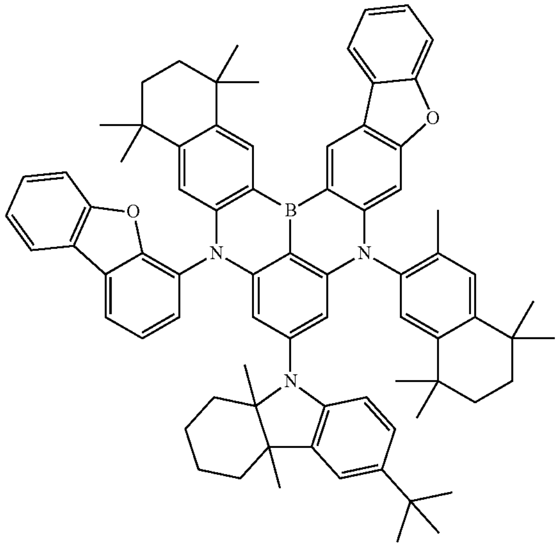
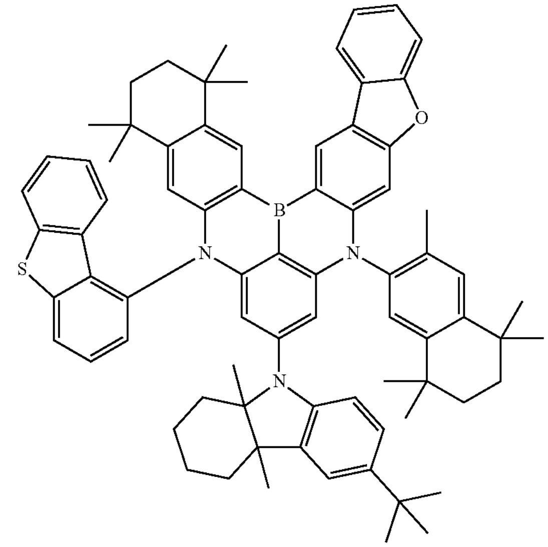
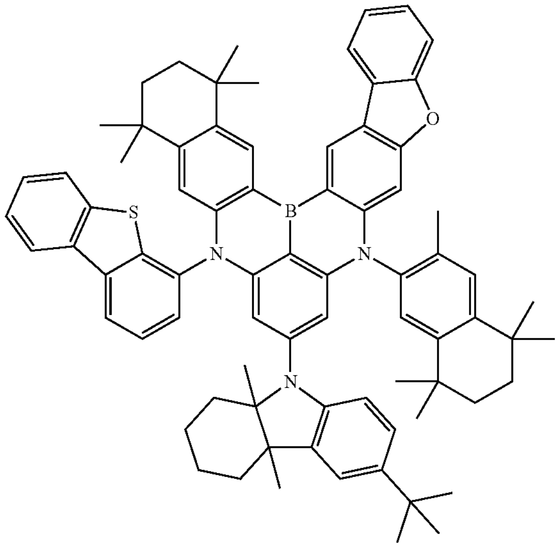
-continued
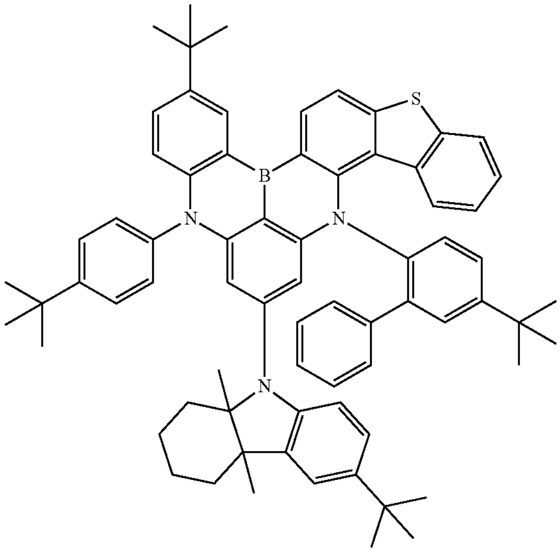
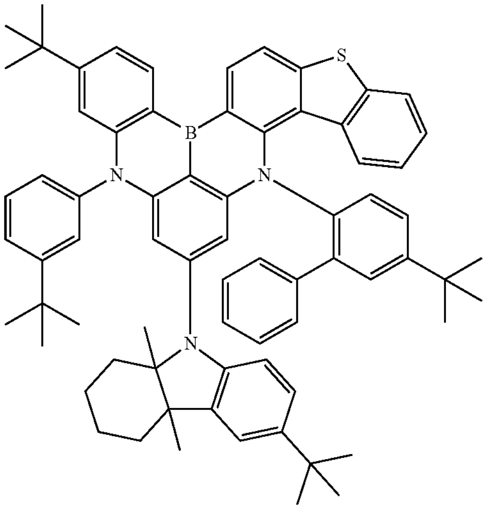
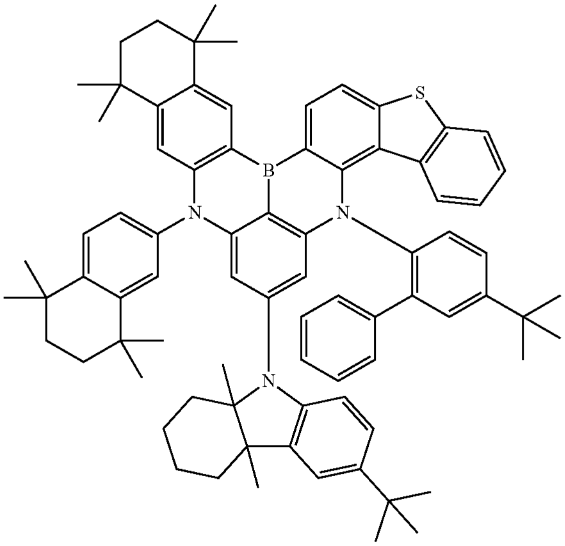

-continued
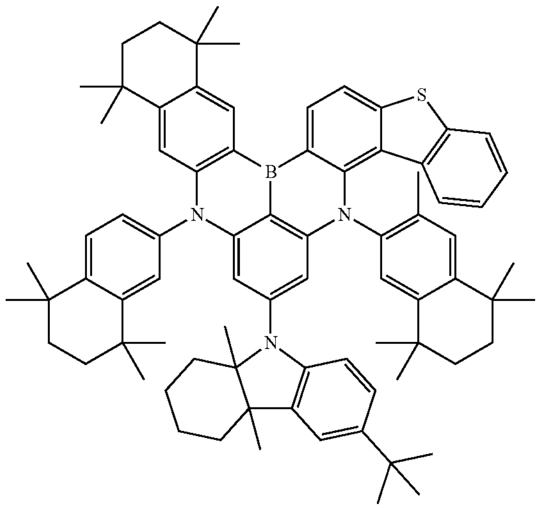
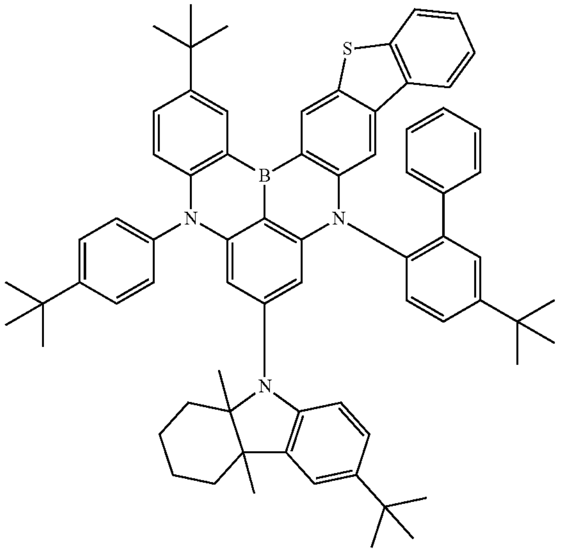
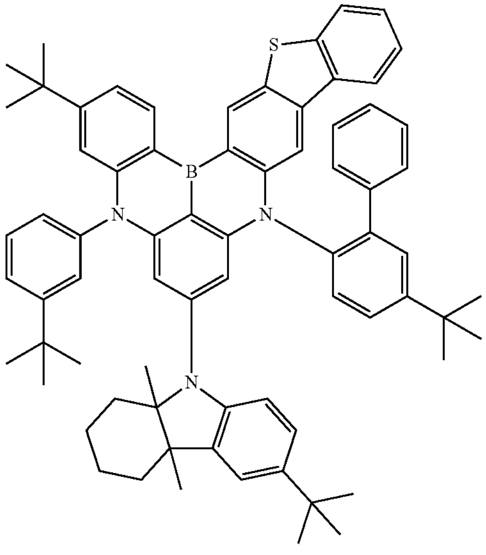
-continued
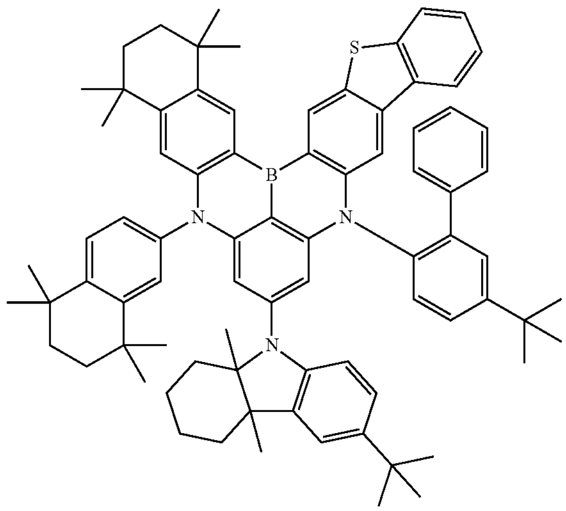
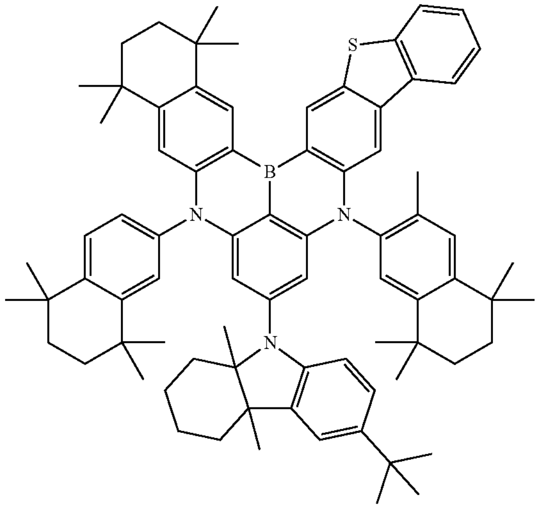
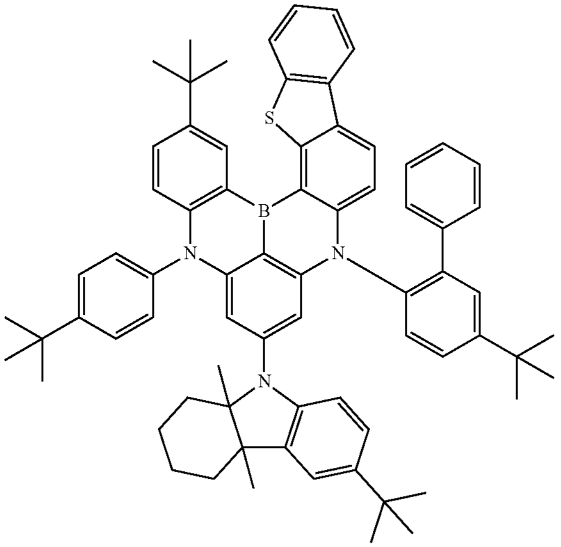

-continued
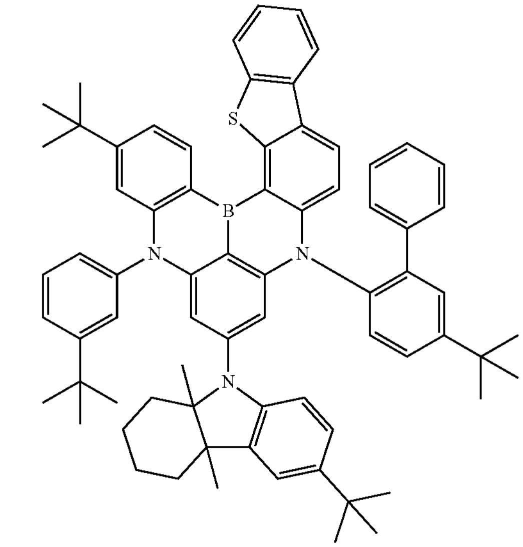
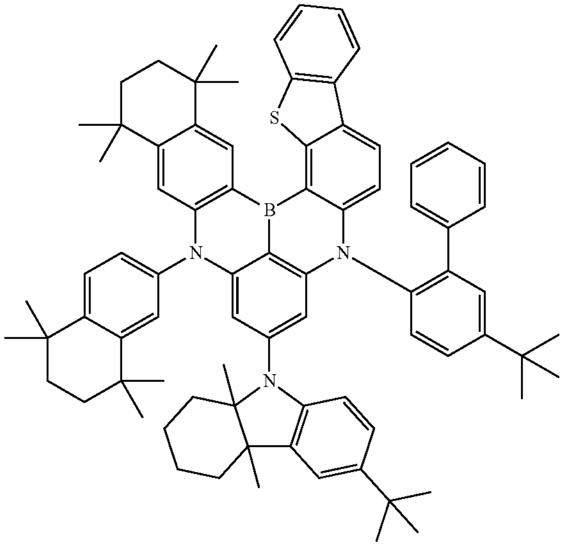
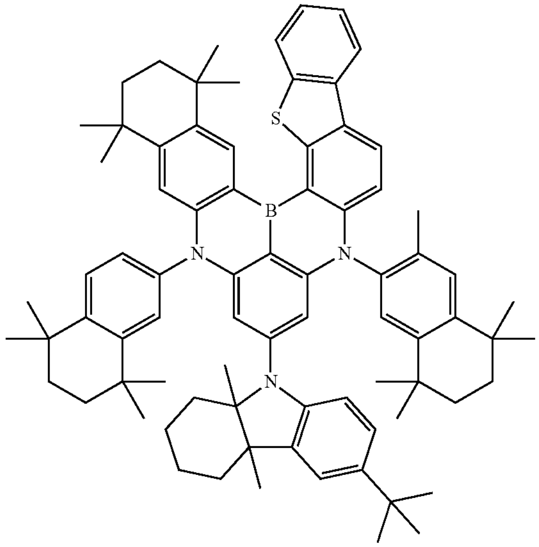
-continued
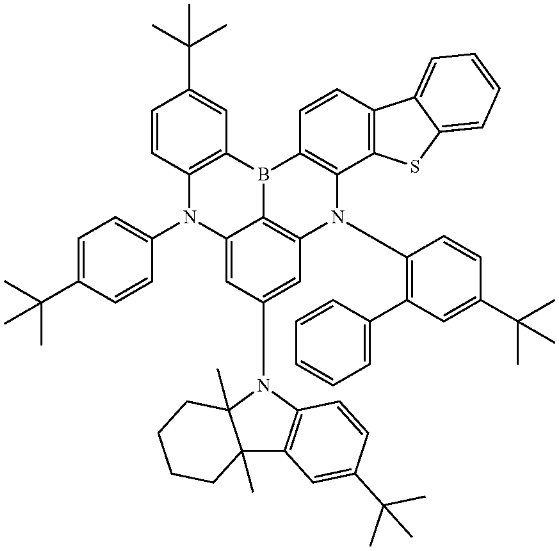
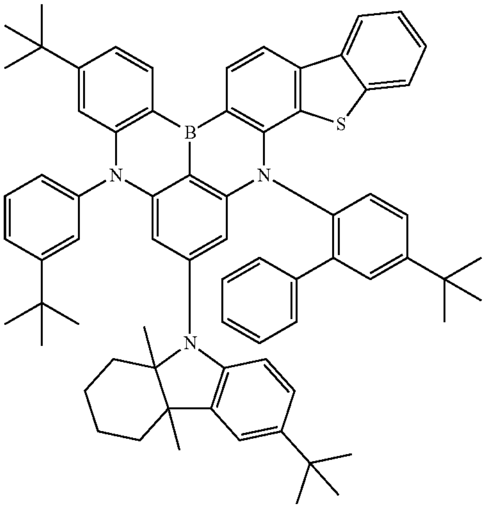
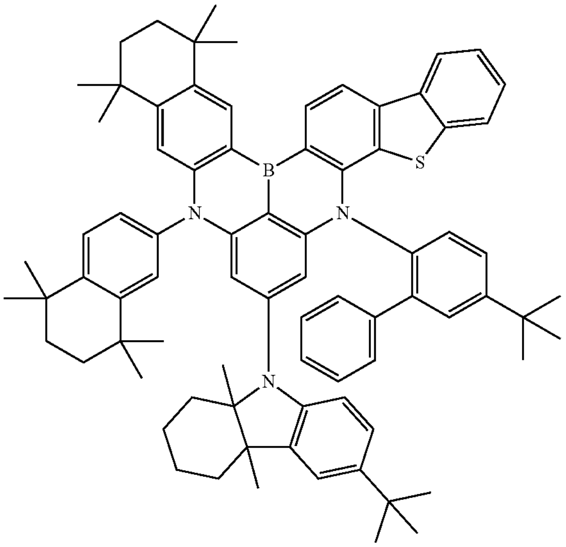

-continued
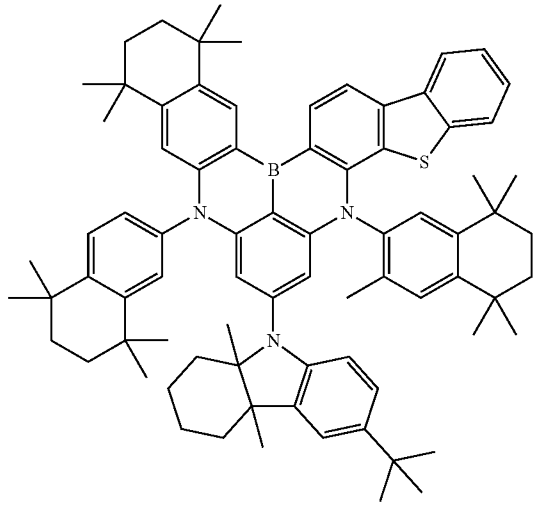
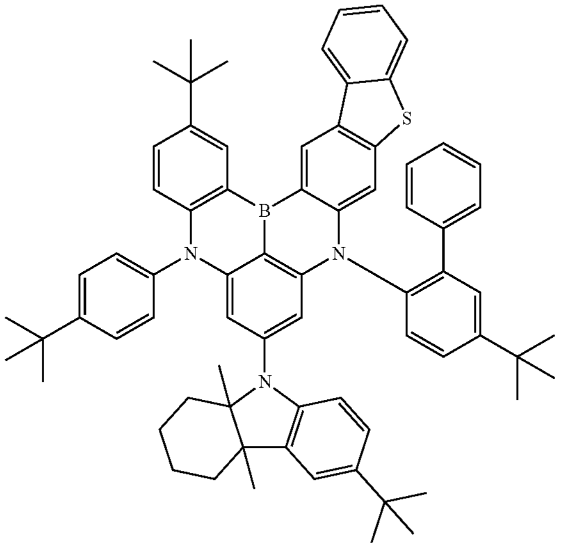
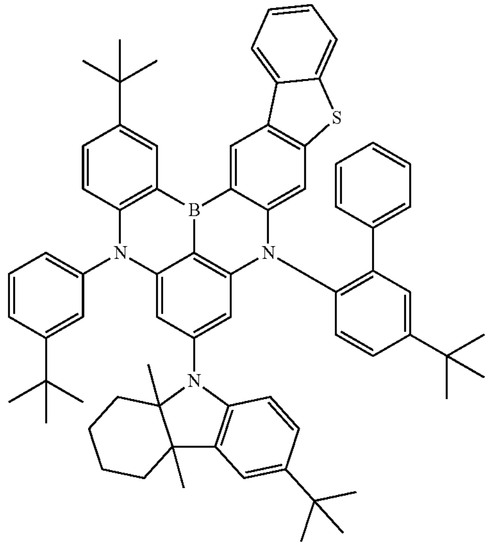
-continued
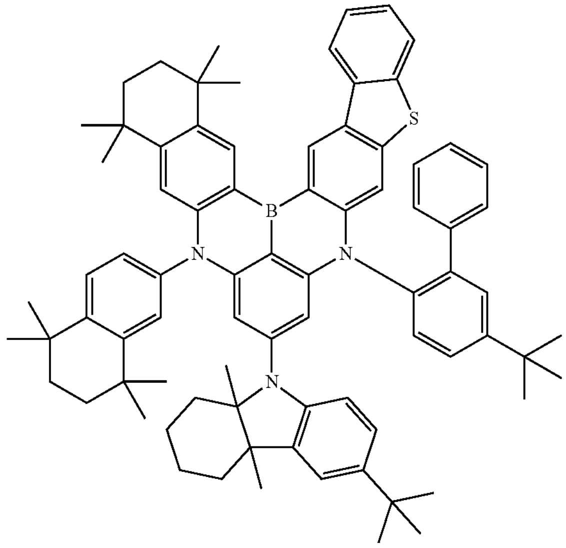
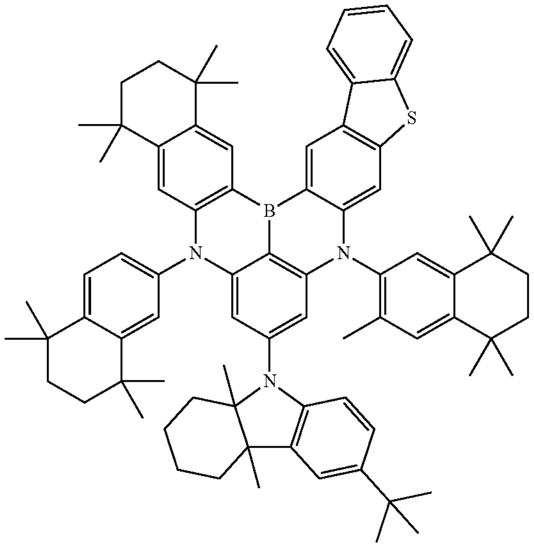
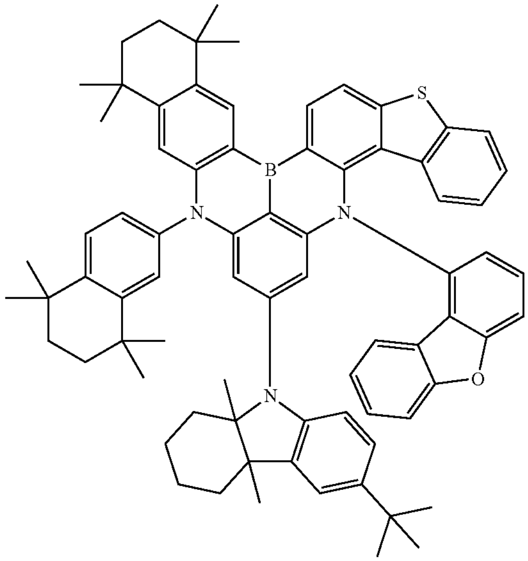

-continued
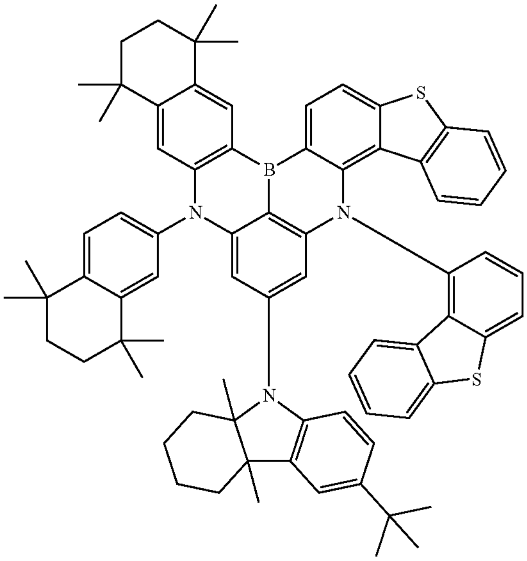
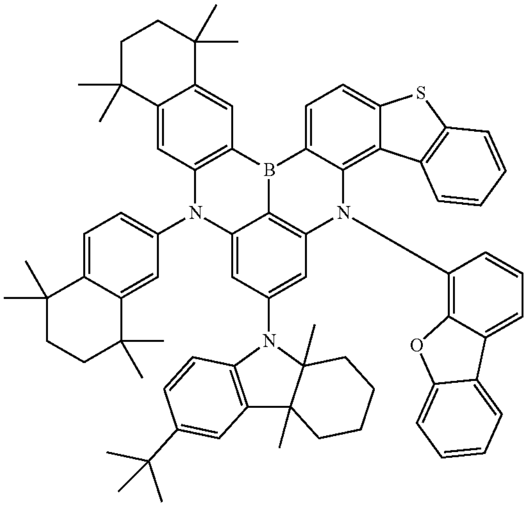
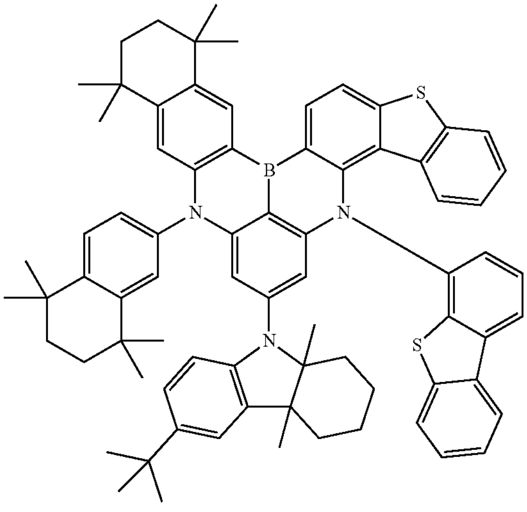
-continued
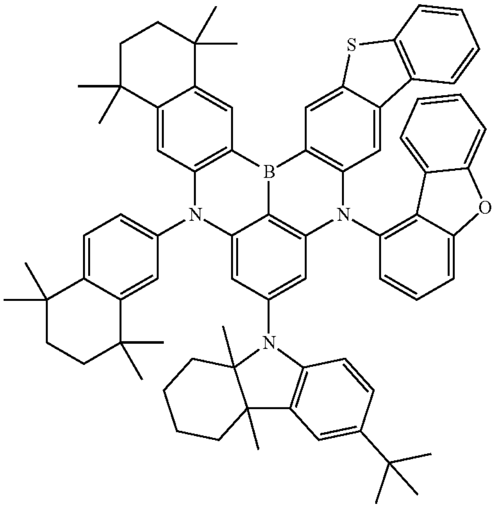
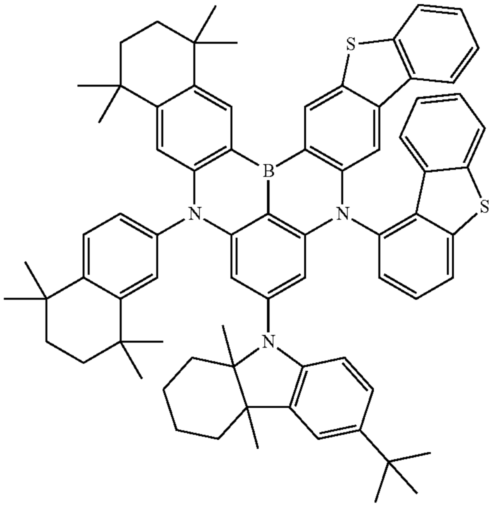
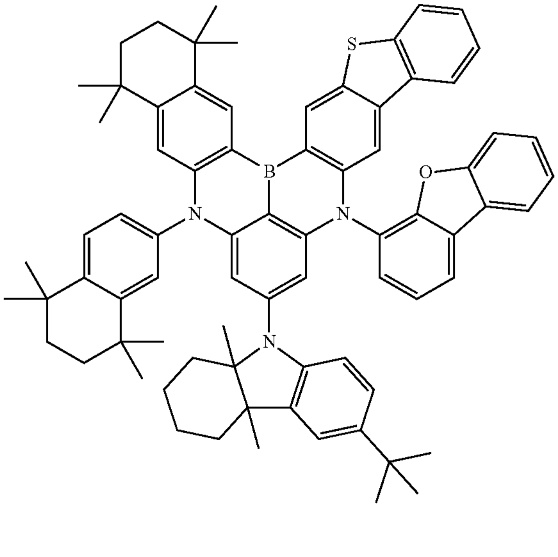

-continued
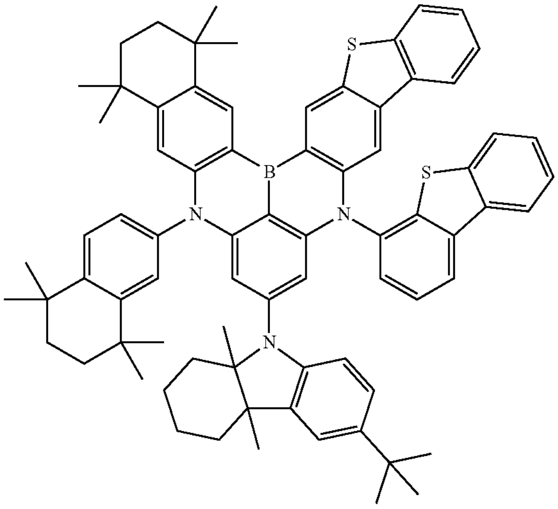
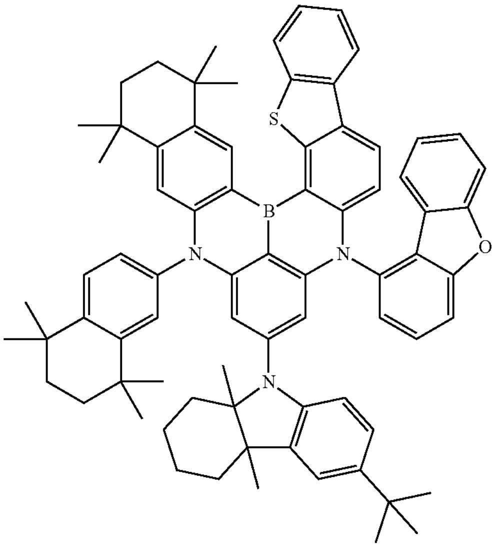
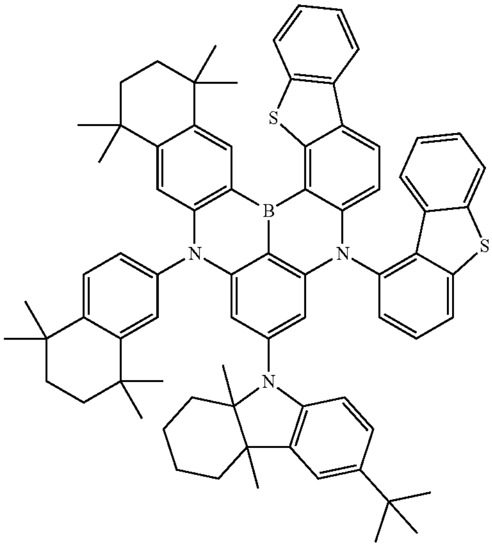
-continued
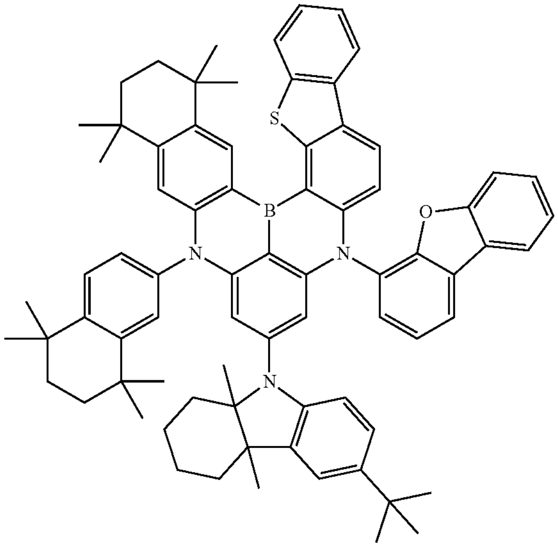
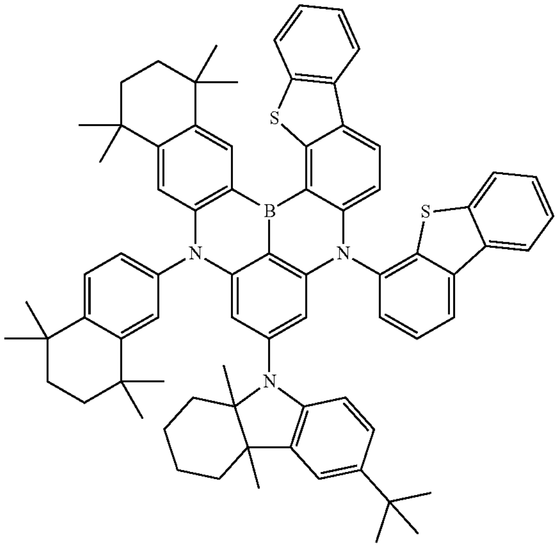
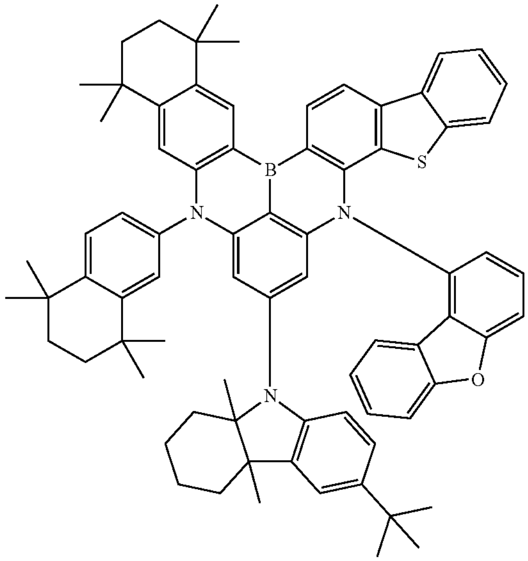

-continued
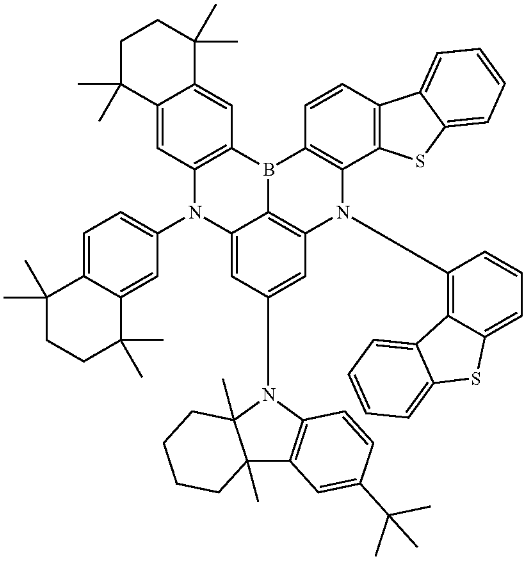
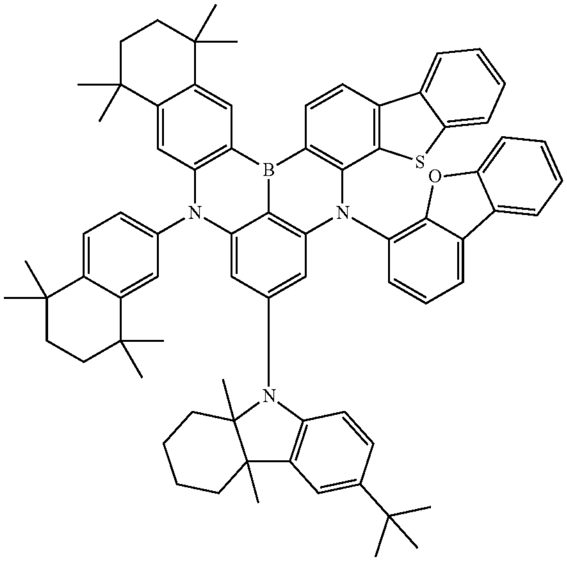
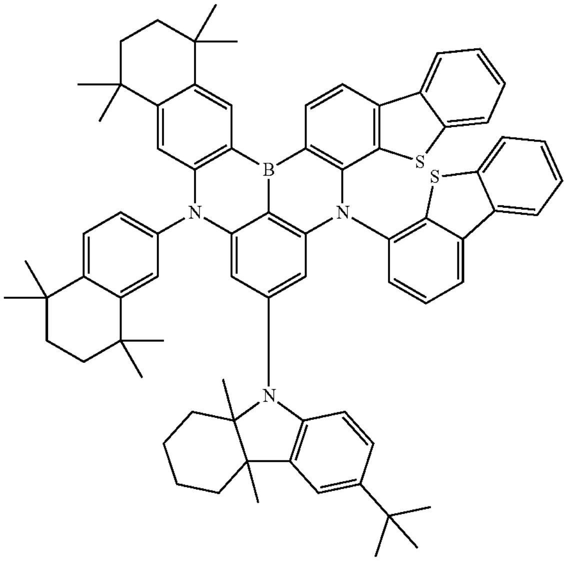
-continued
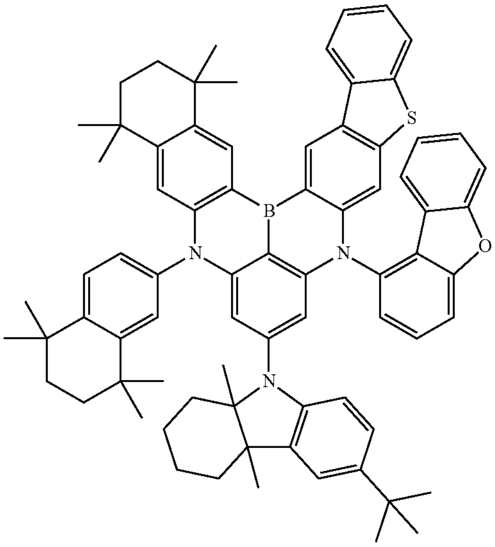
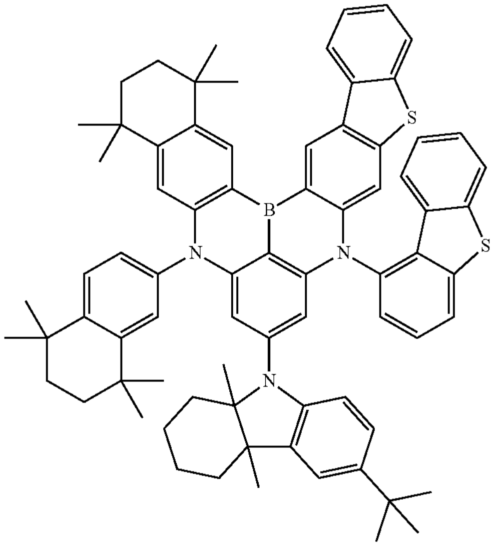
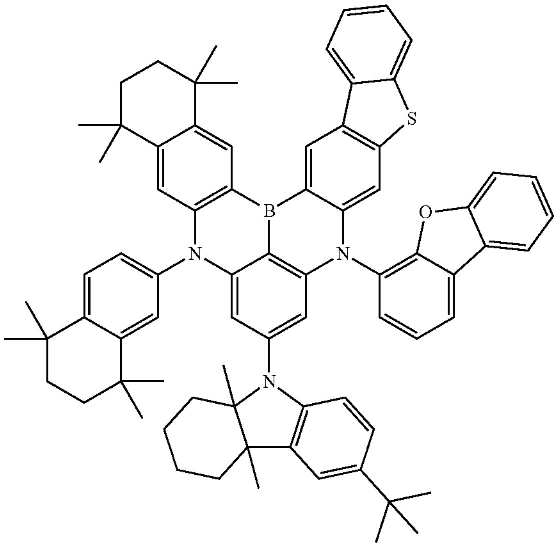

-continued
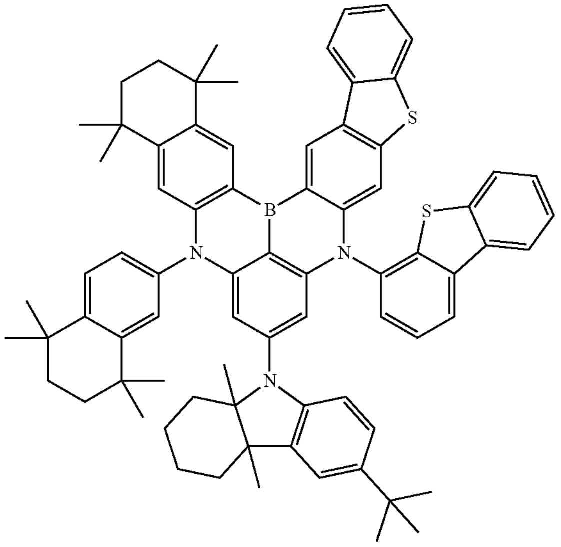
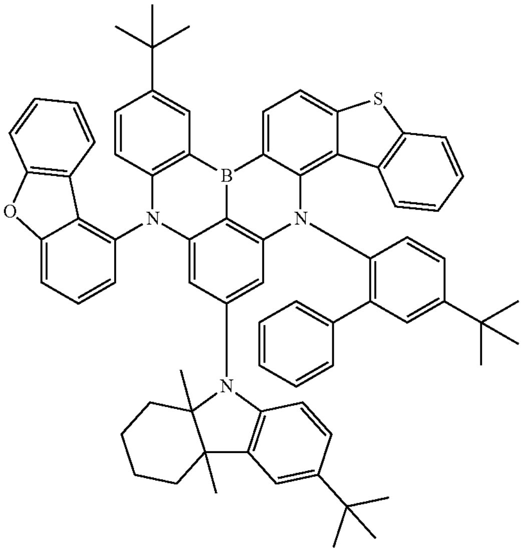
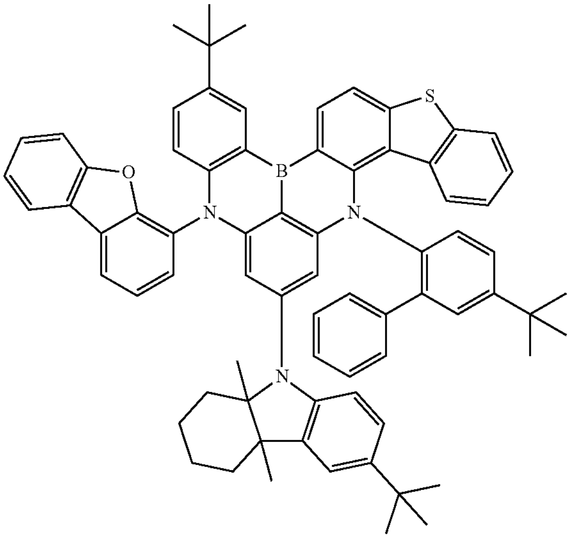
-continued
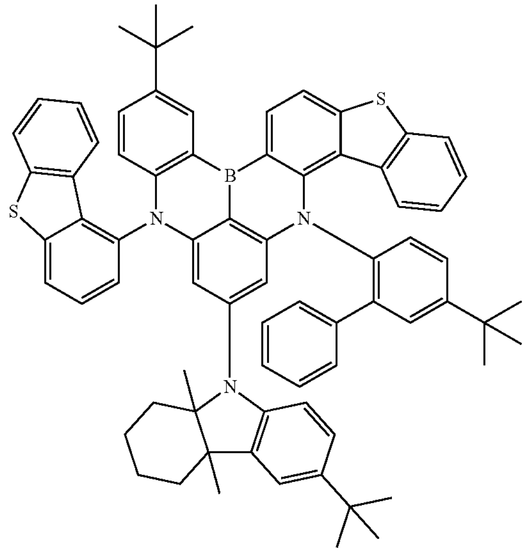
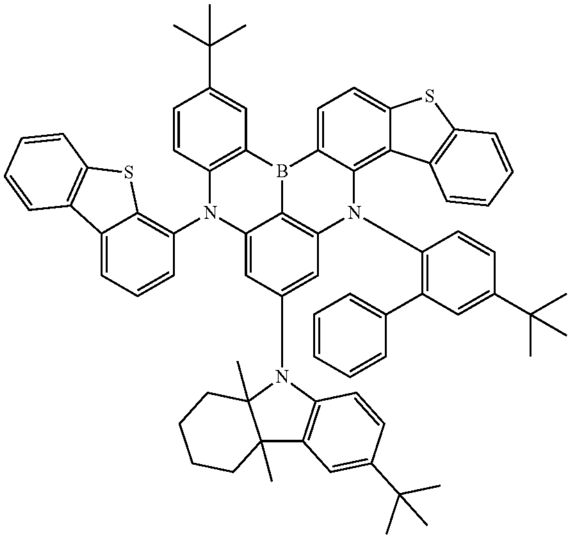
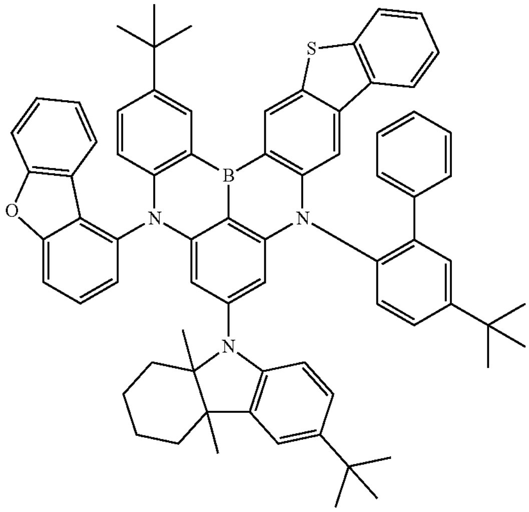

-continued
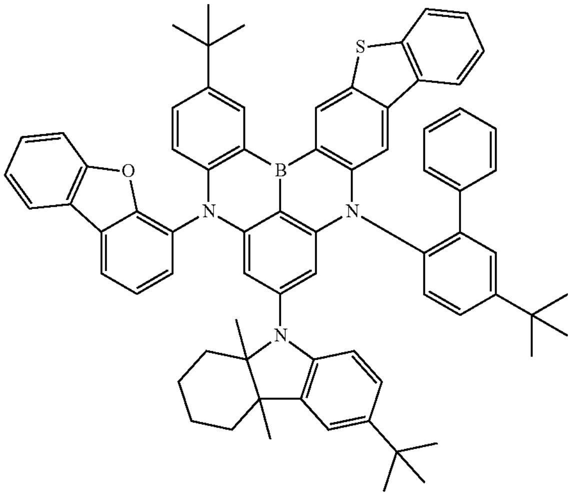
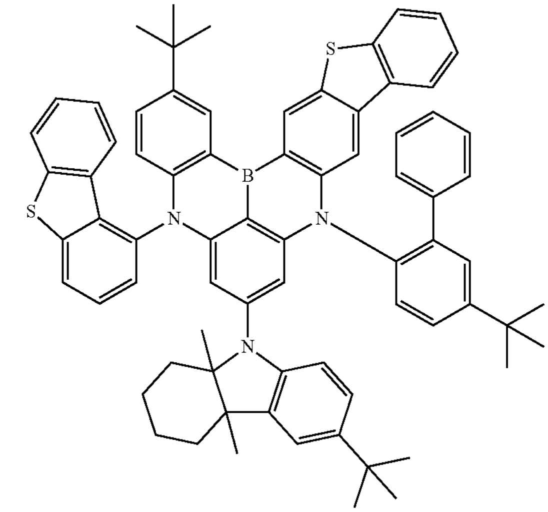
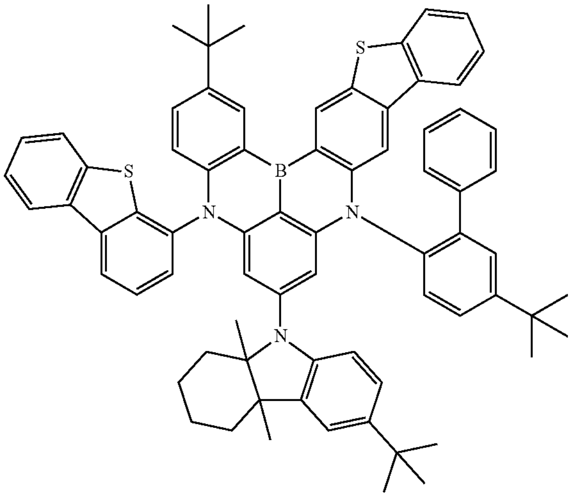
-continued
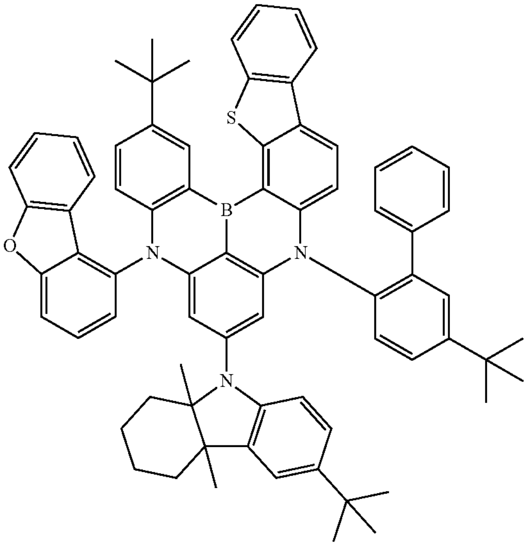
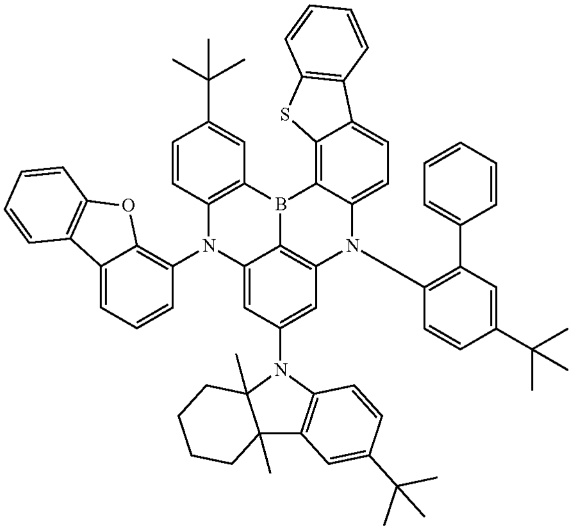
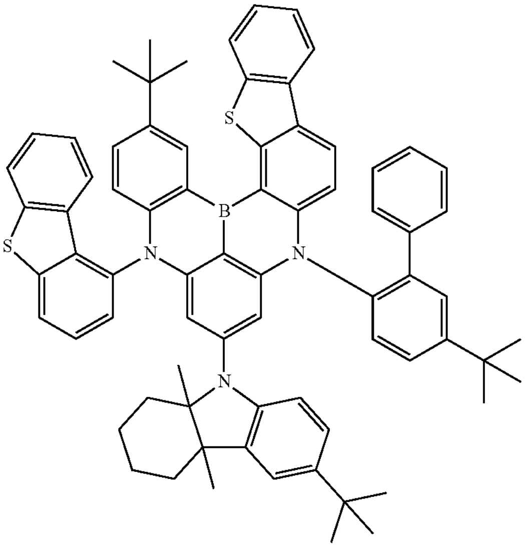

-continued
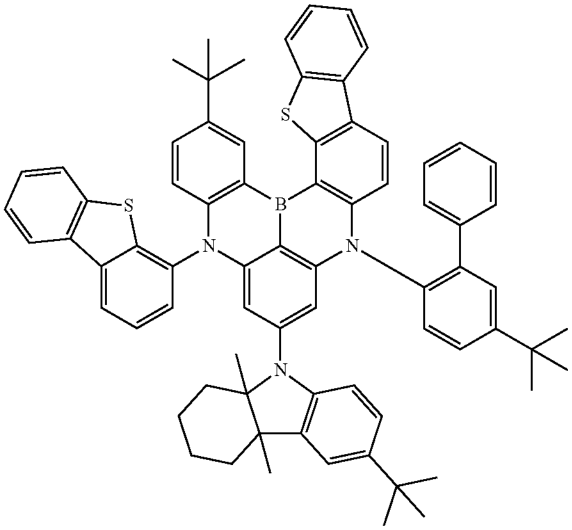
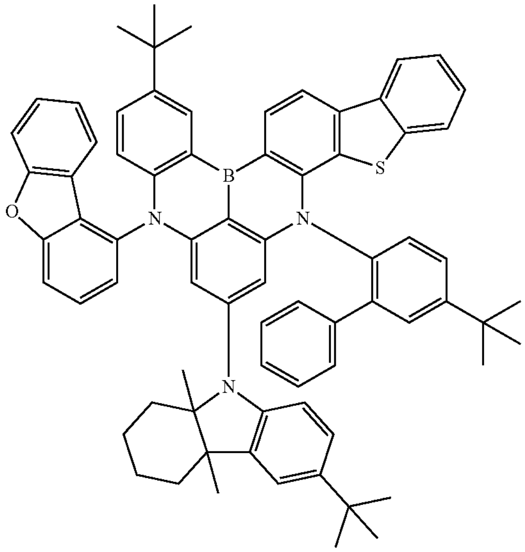
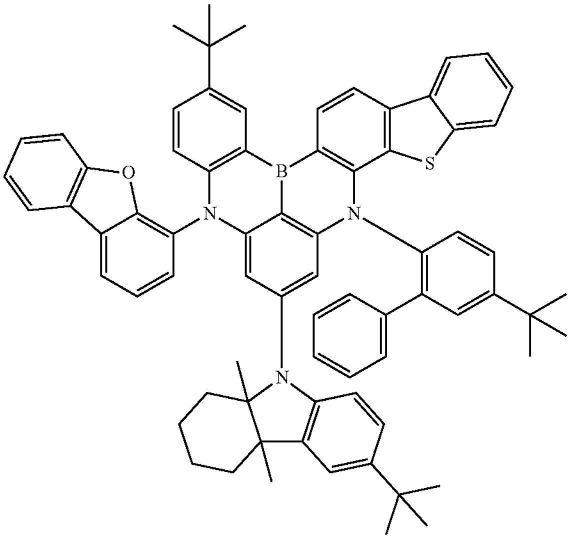
-continued
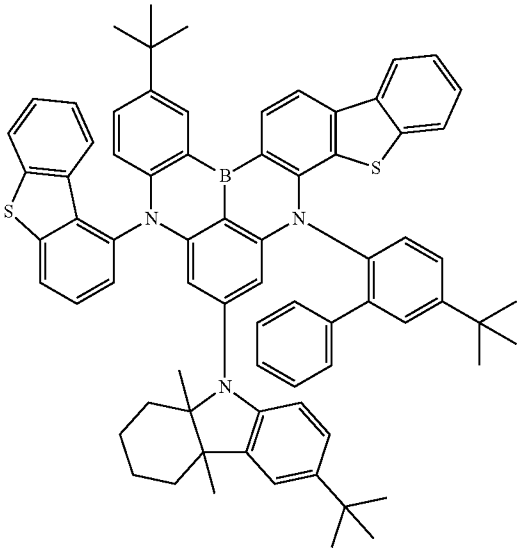
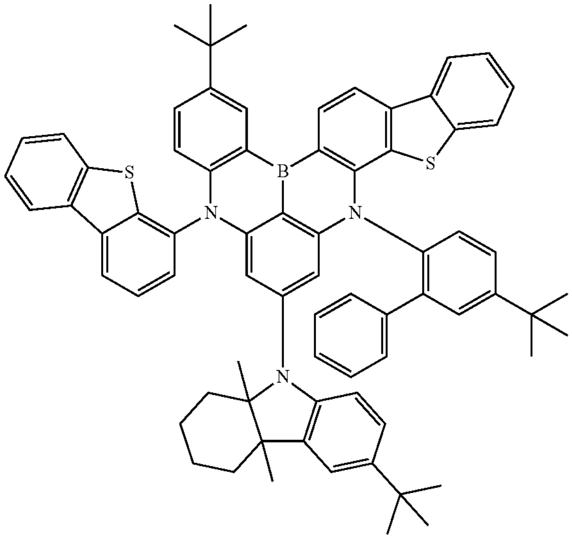
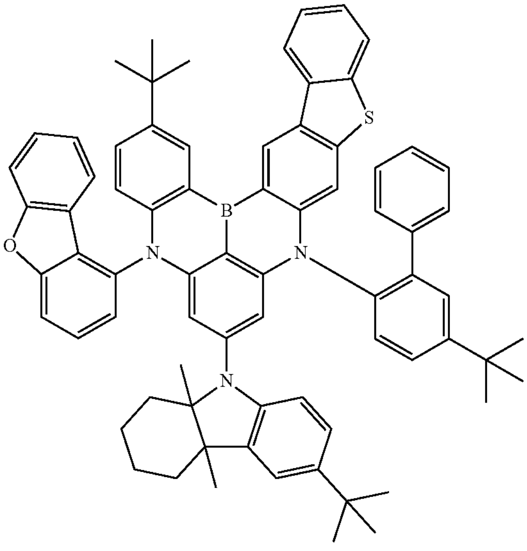

-continued
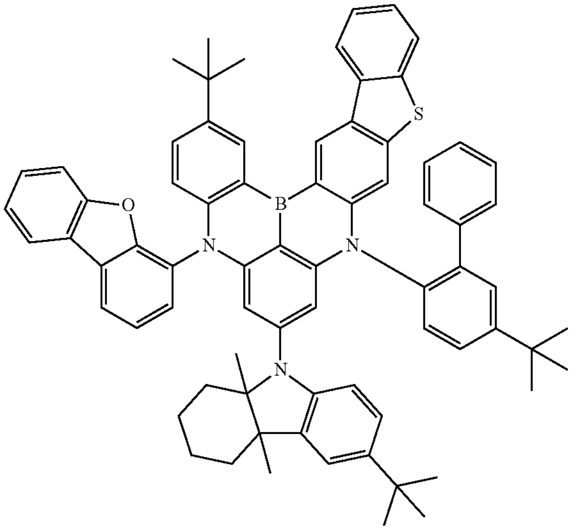
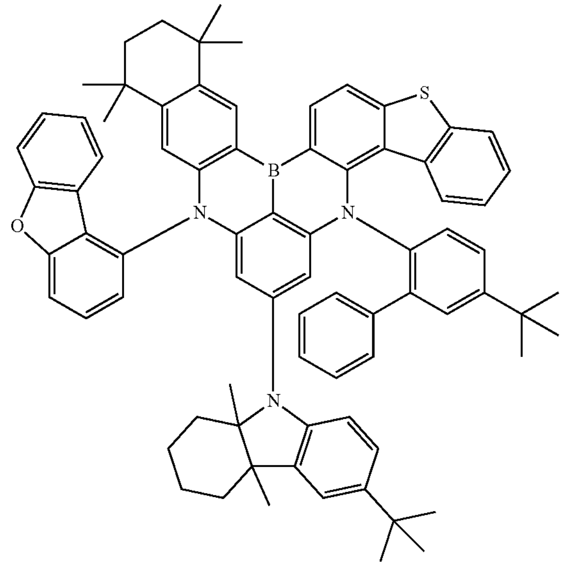
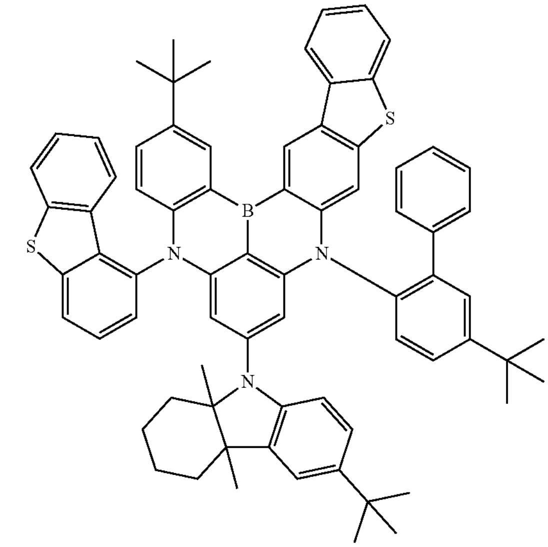
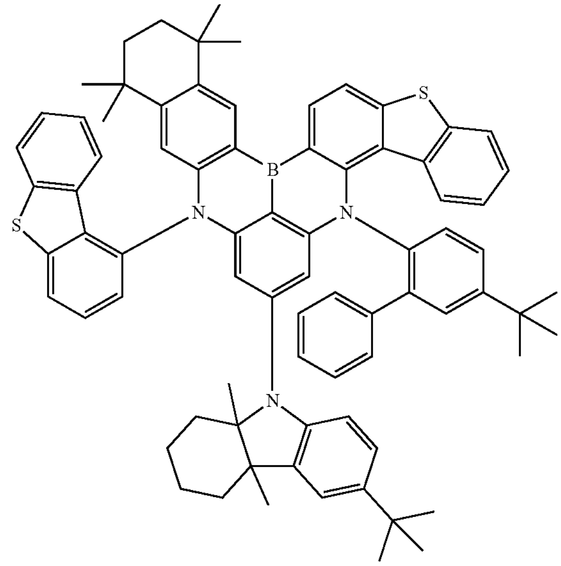
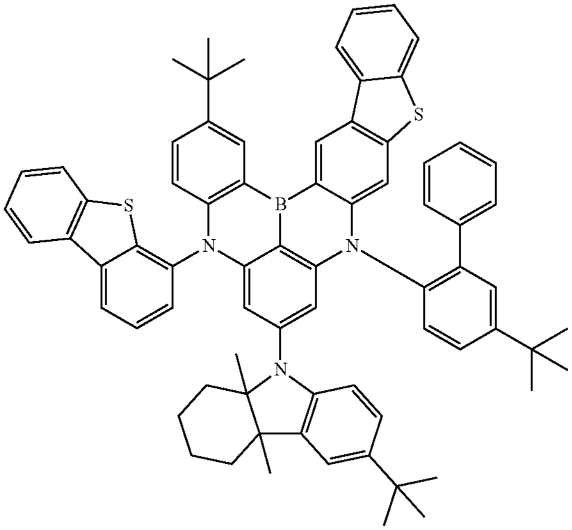
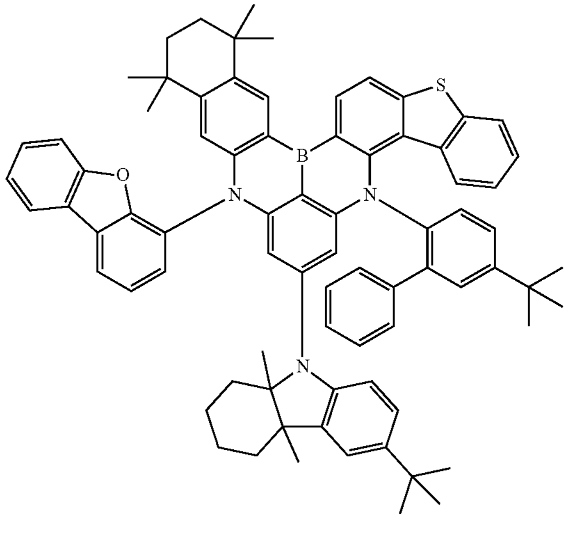

-continued
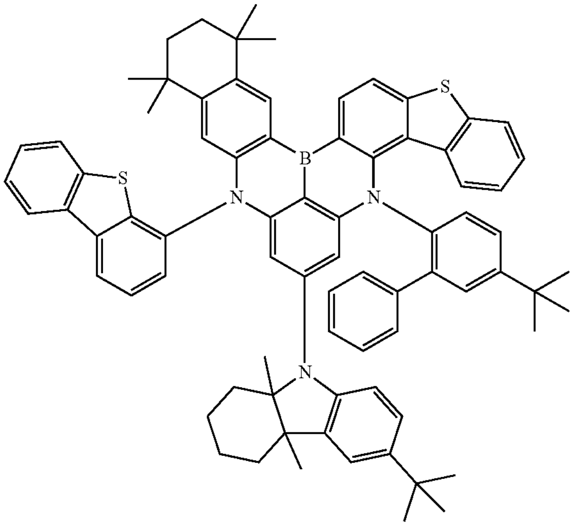
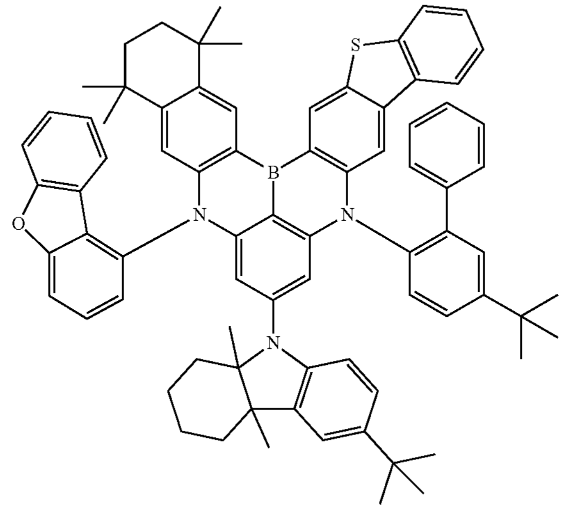
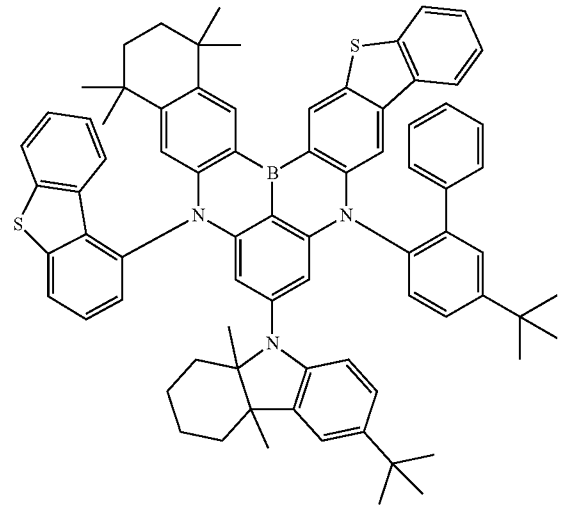
-continued
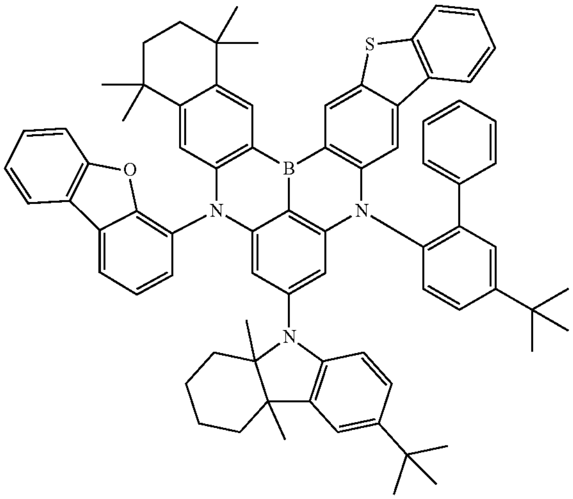
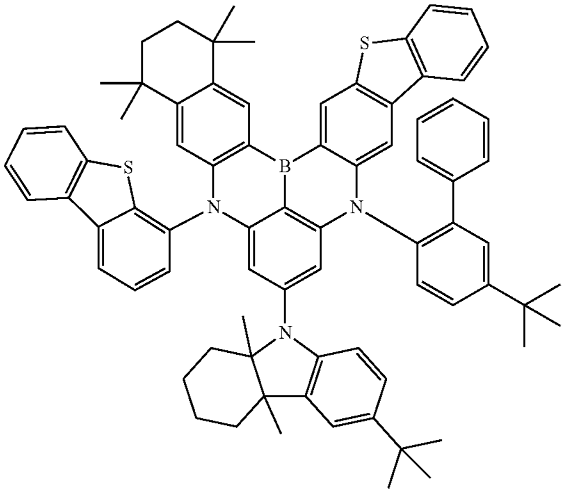
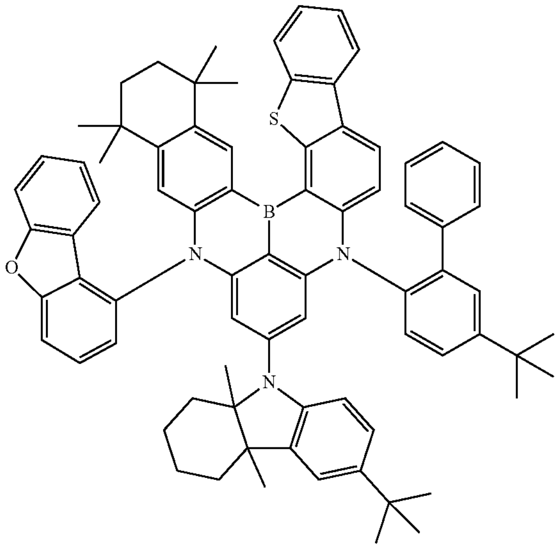

-continued
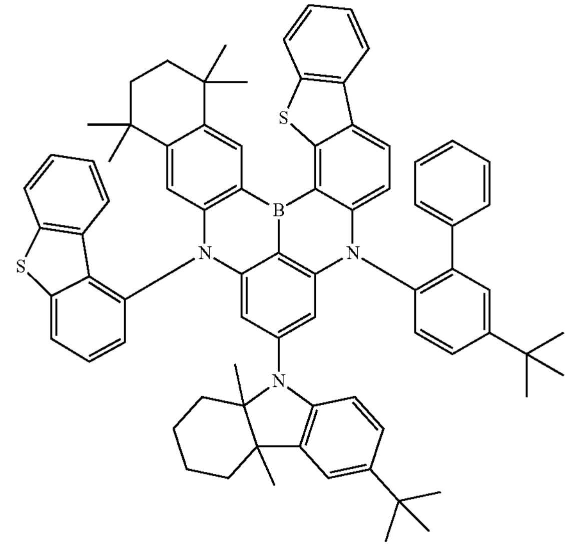
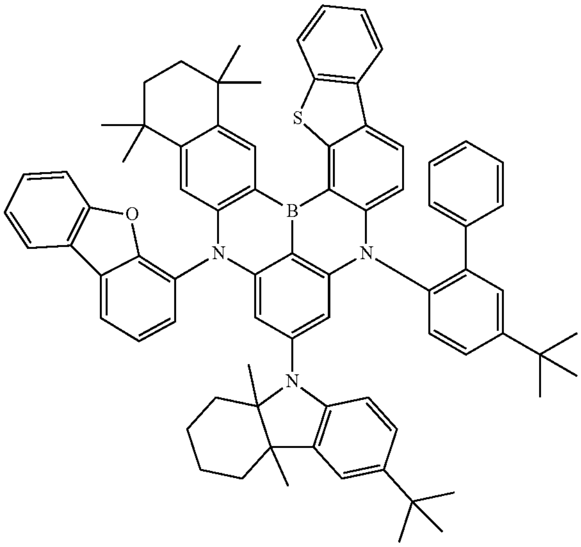
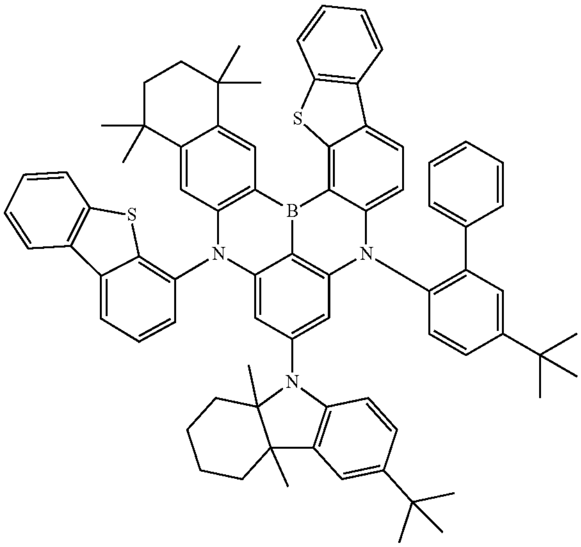
-continued
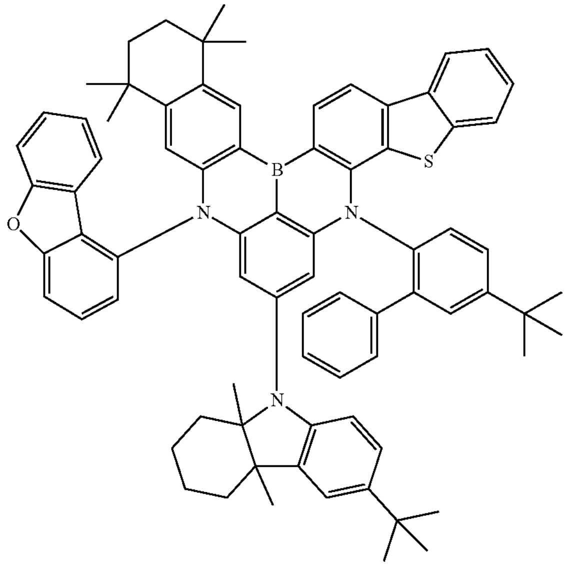
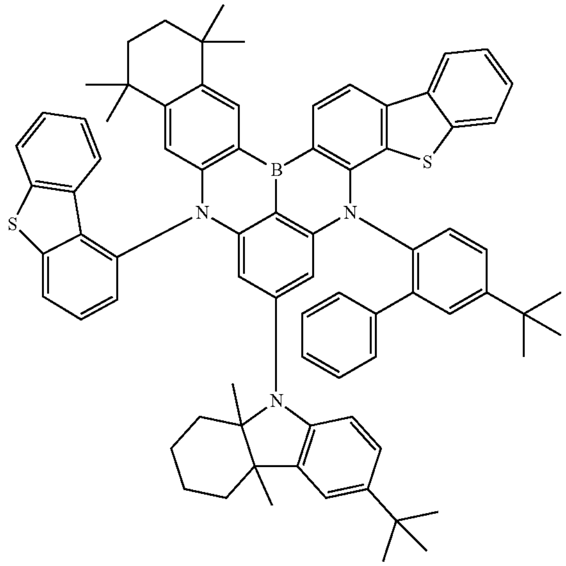
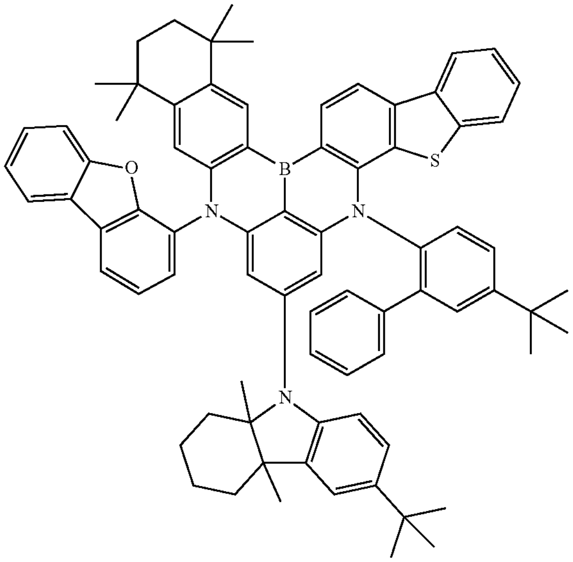

-continued
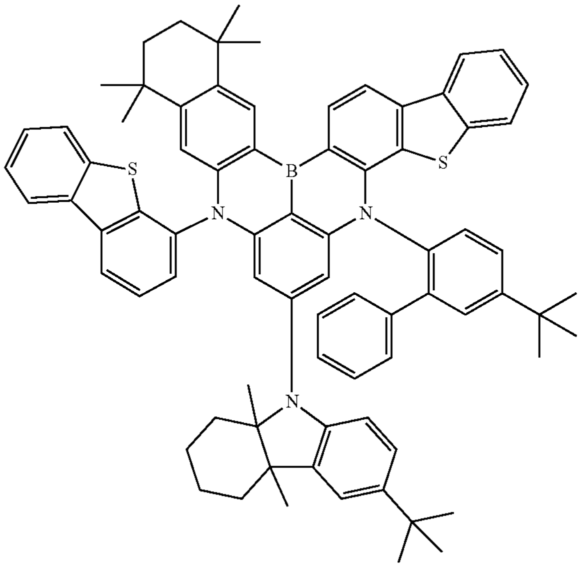
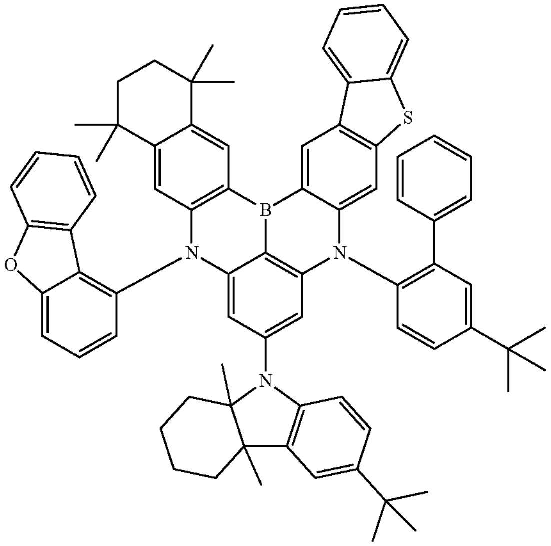
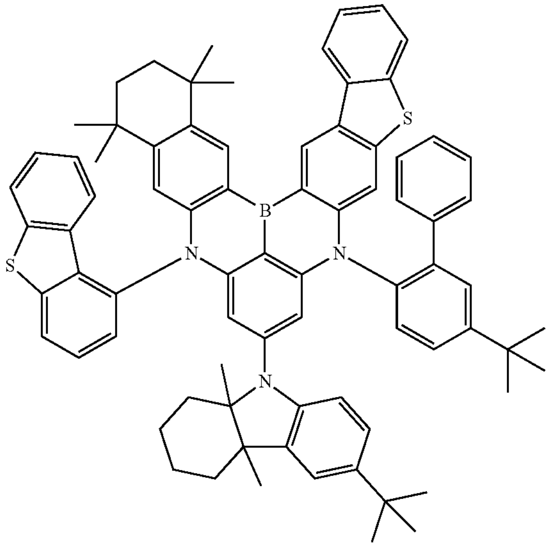
-continued
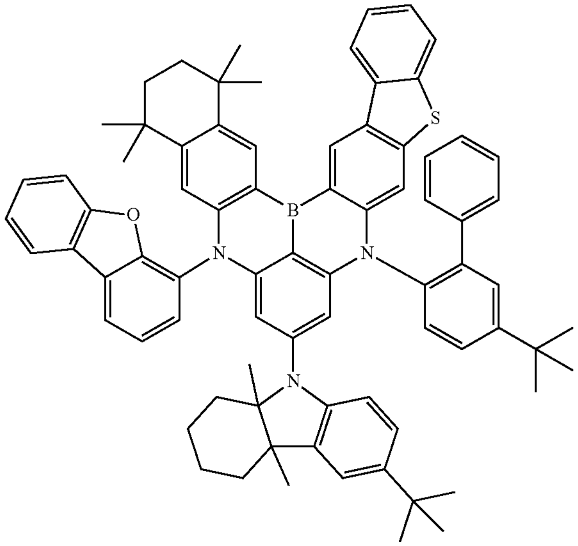
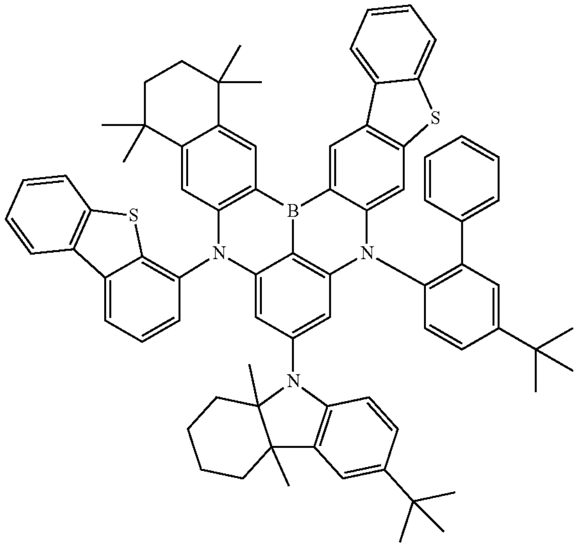
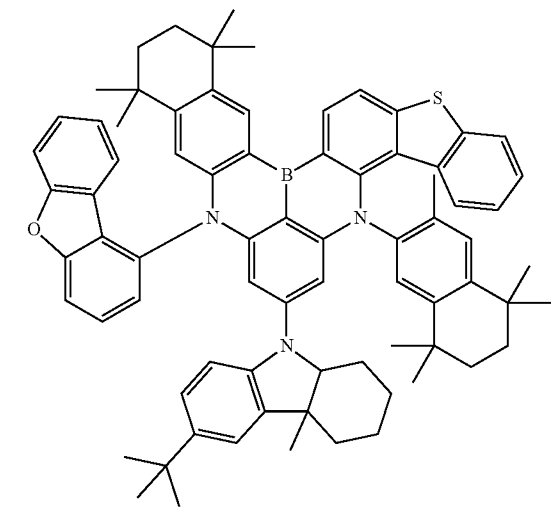

-continued
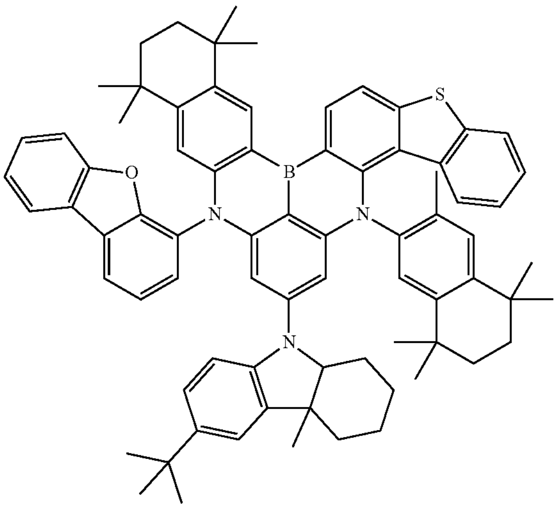
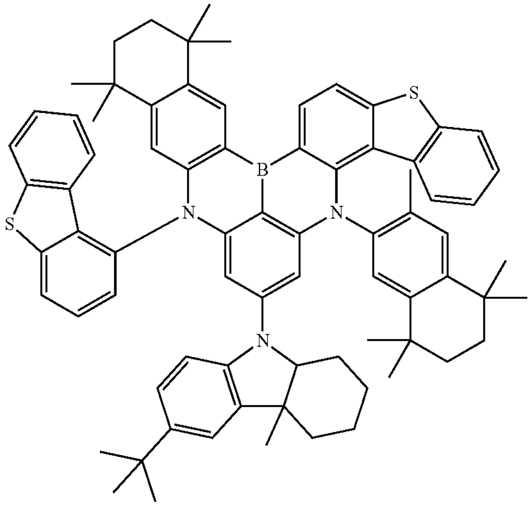
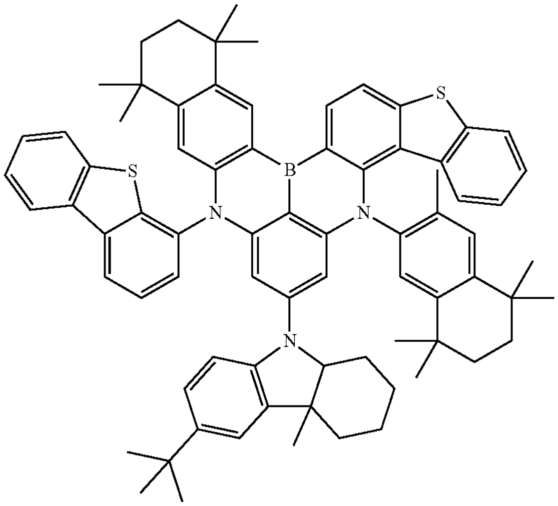
-continued
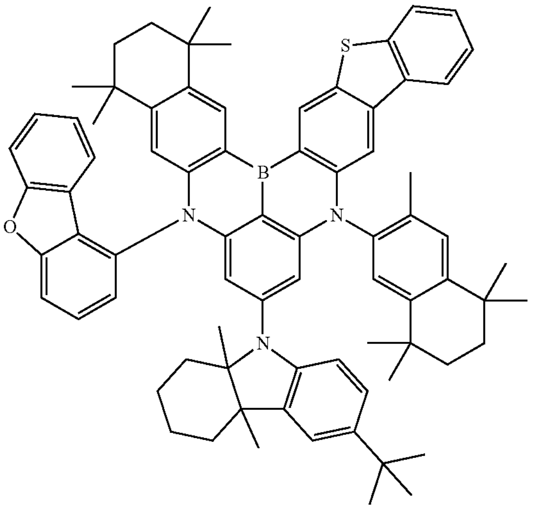
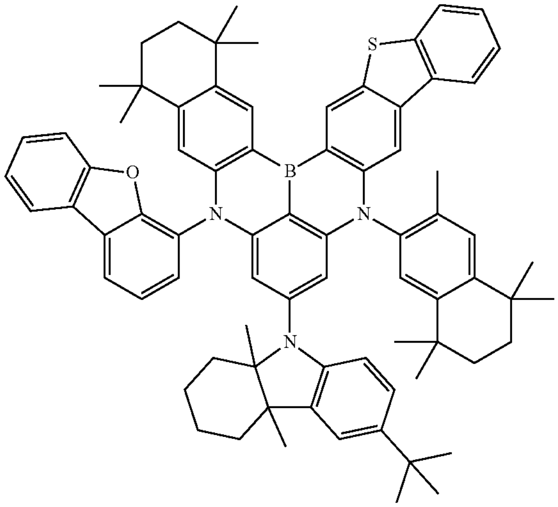
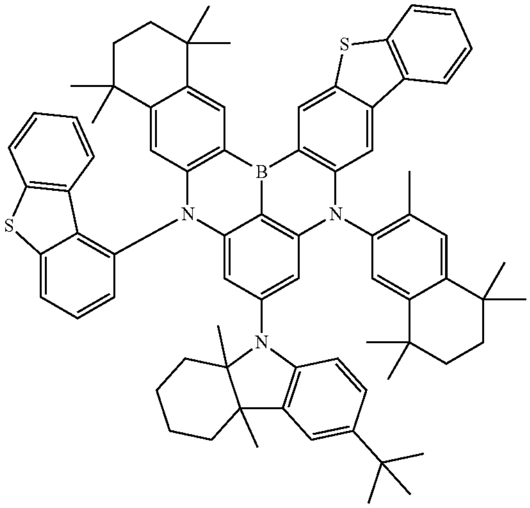

-continued
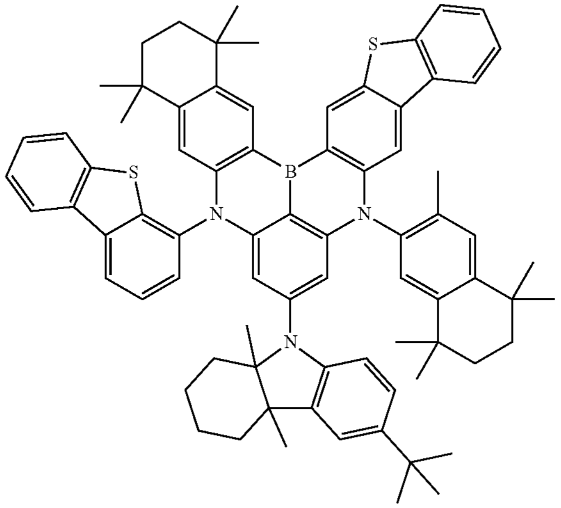
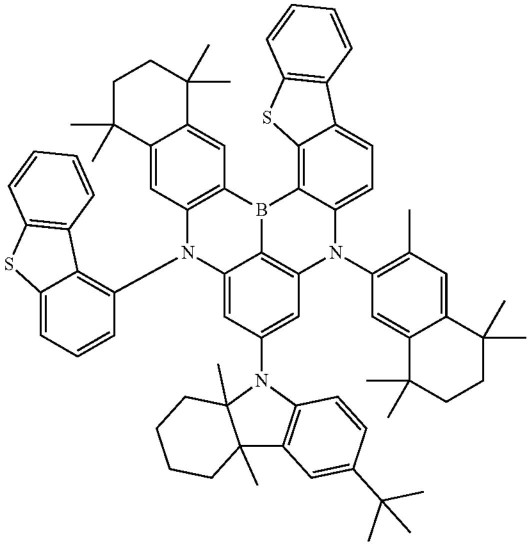
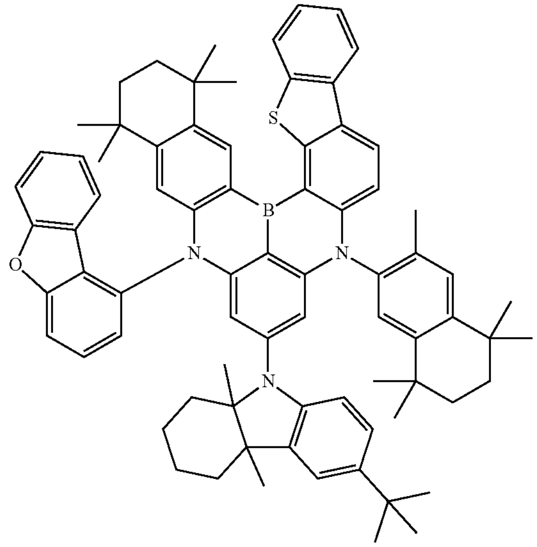
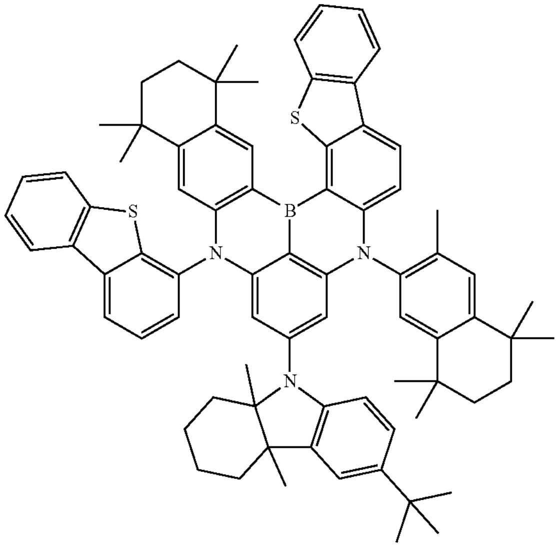
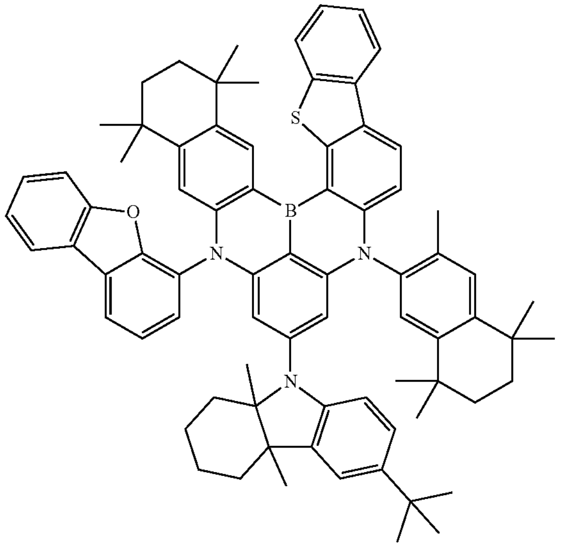
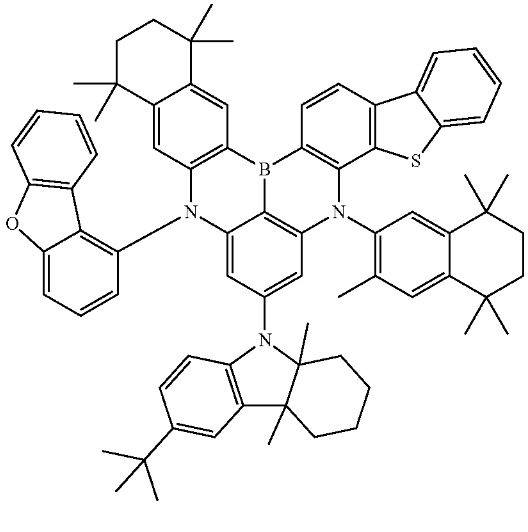
-continued -continued
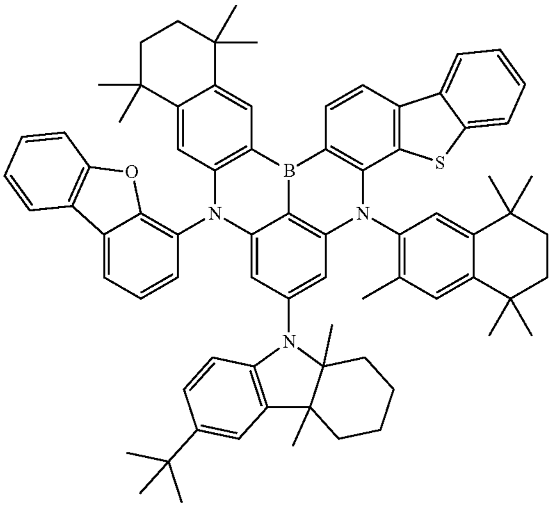
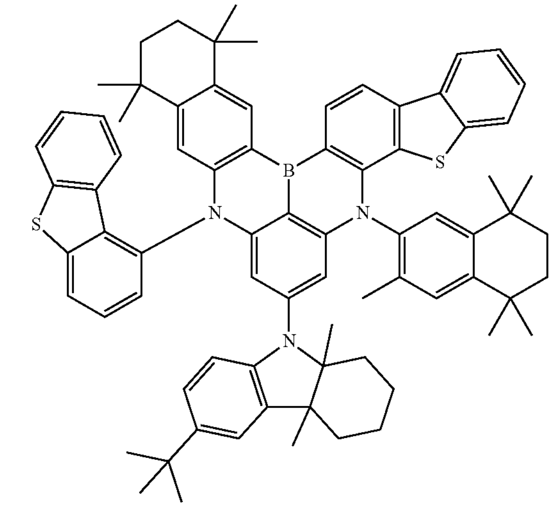
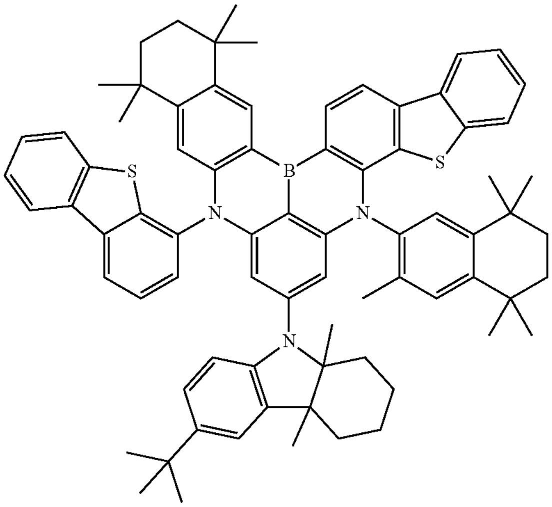
-continued
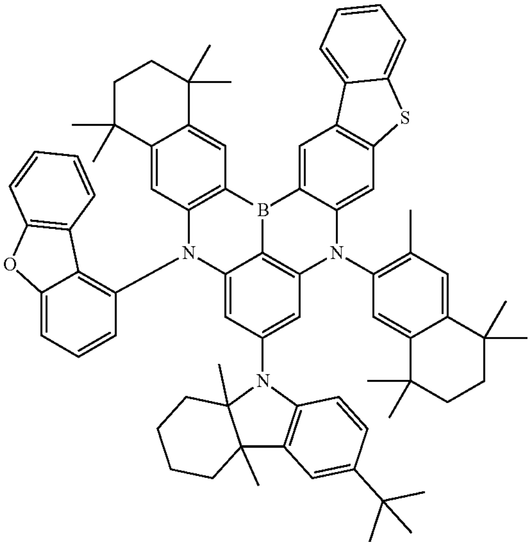
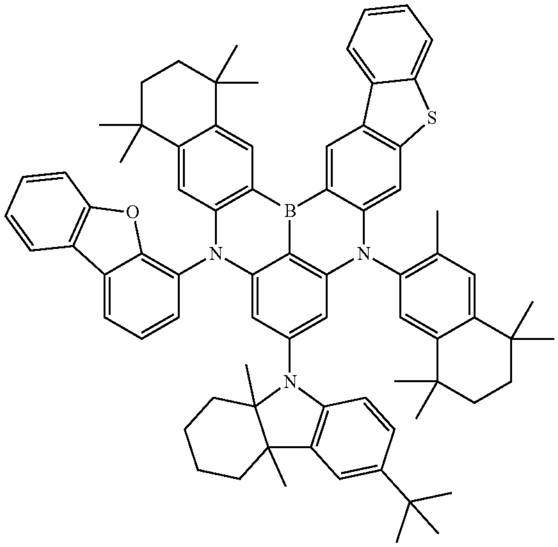
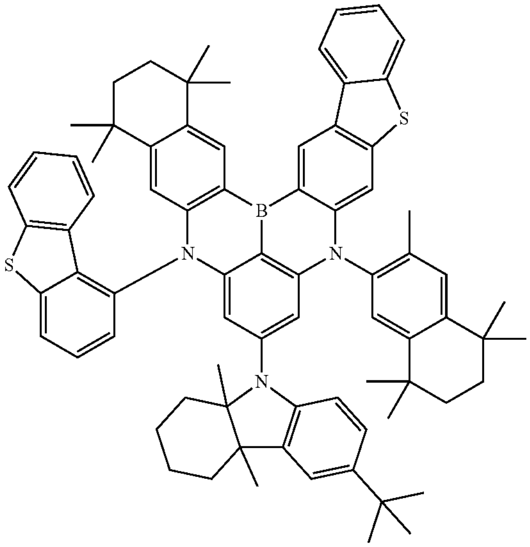

-continued
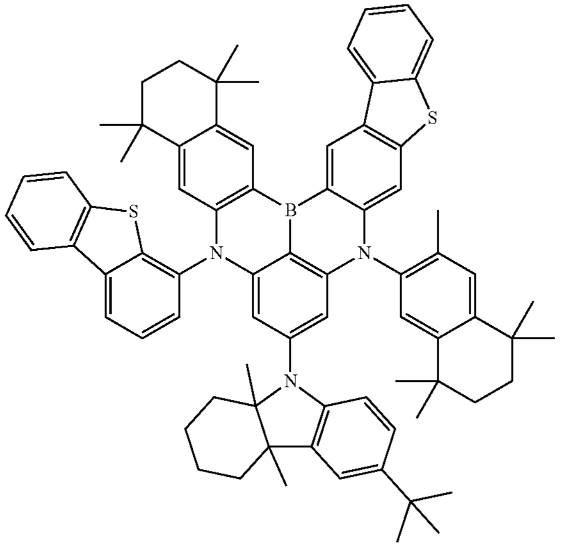
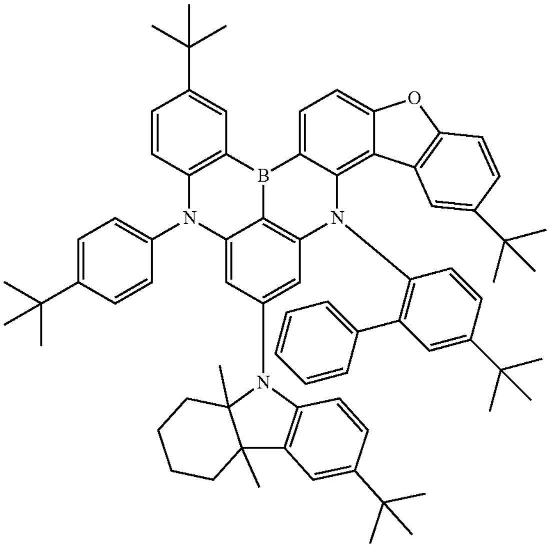
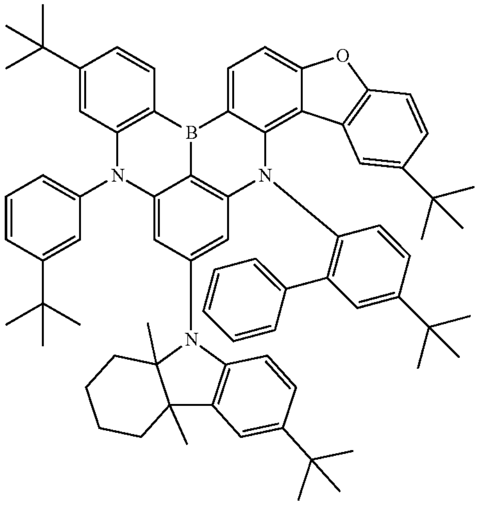
-continued
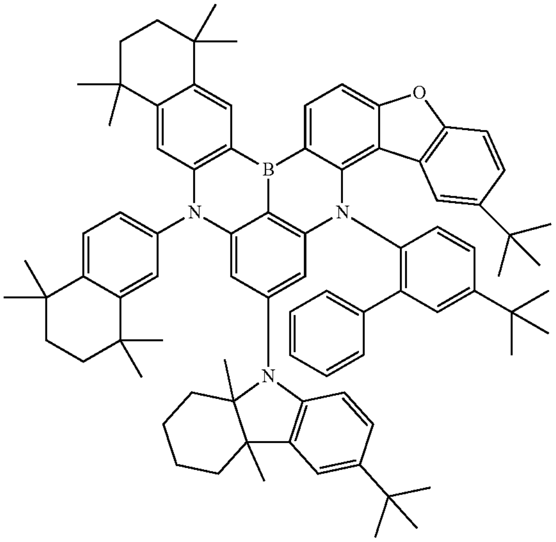
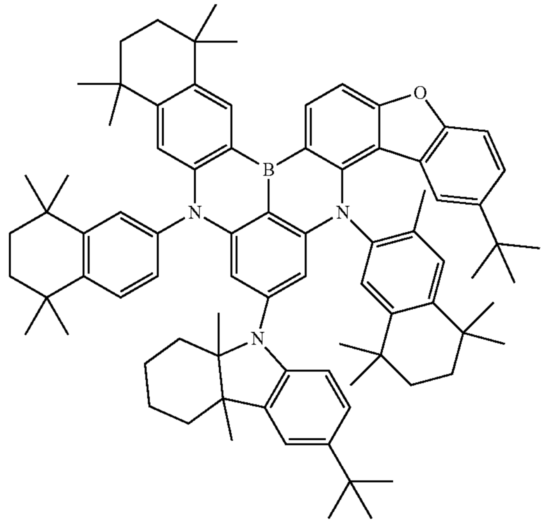
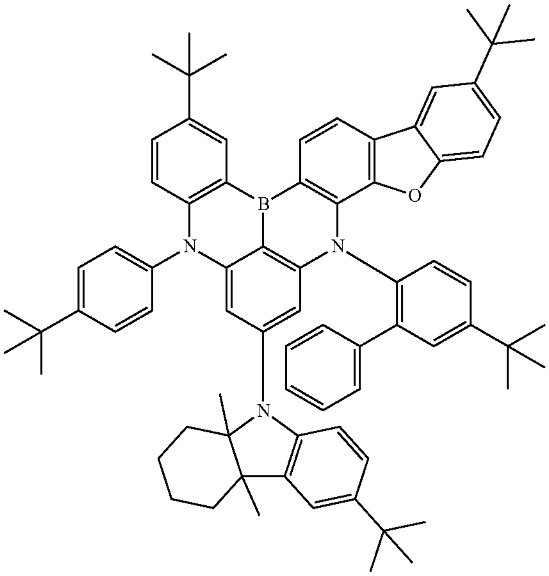

-continued
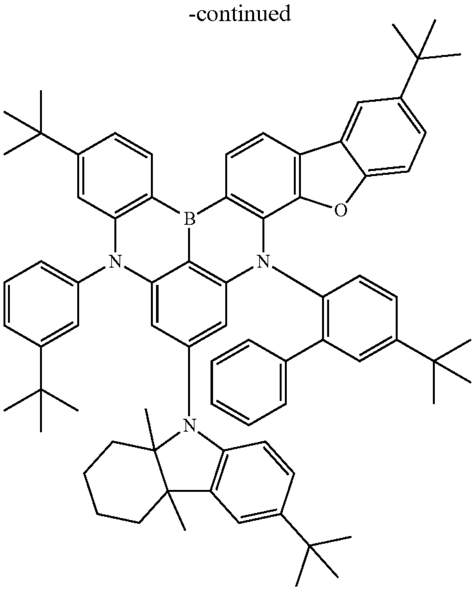
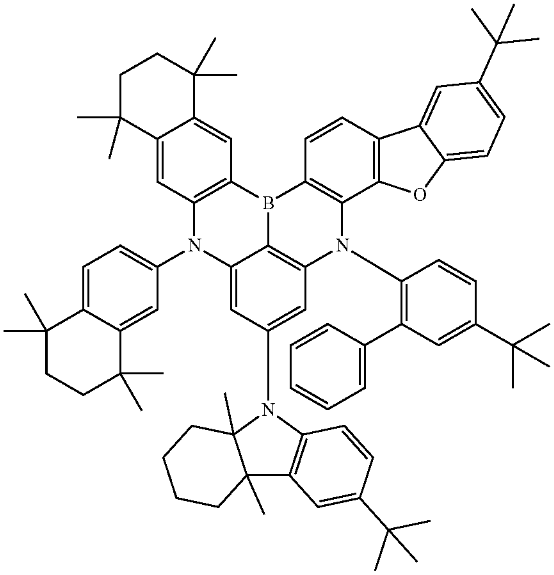
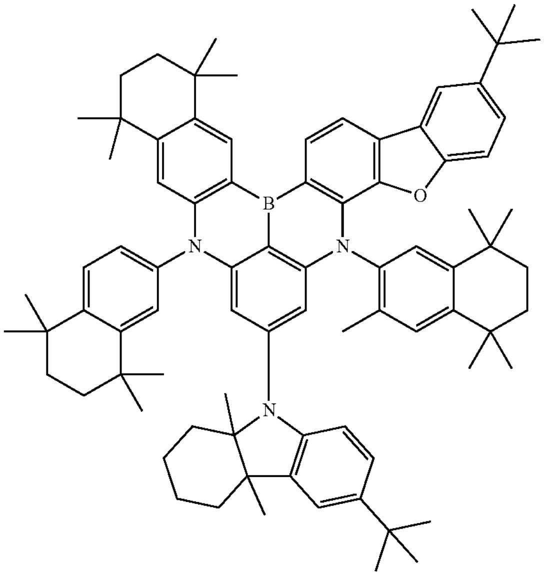
-continued
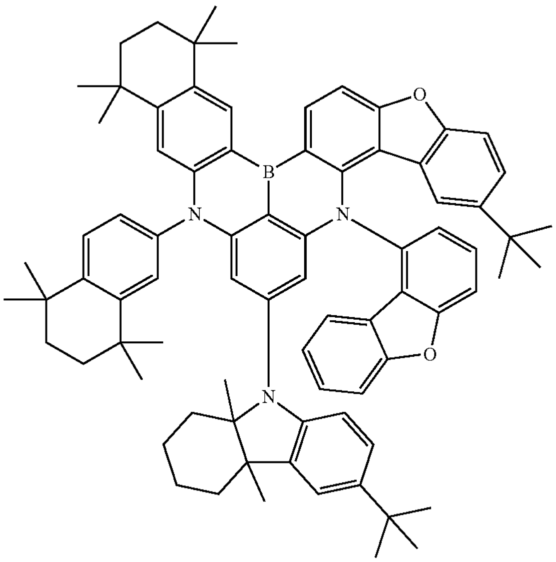
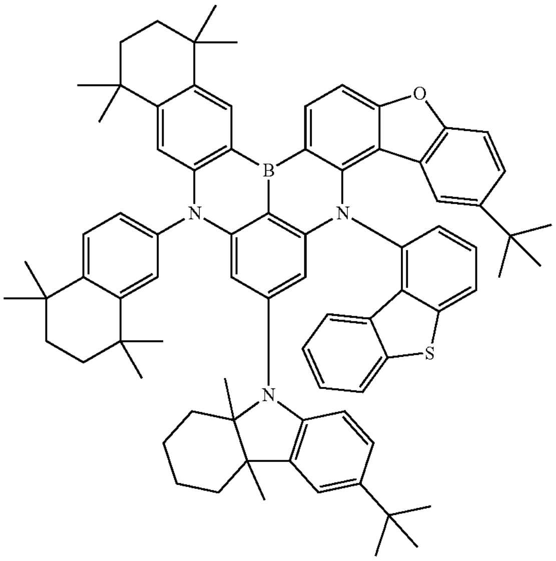
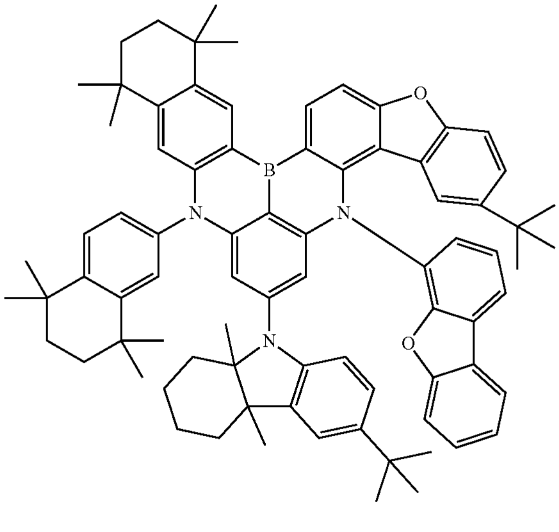

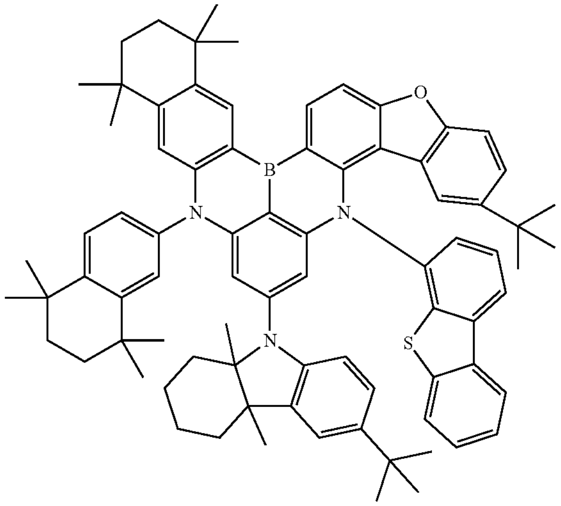
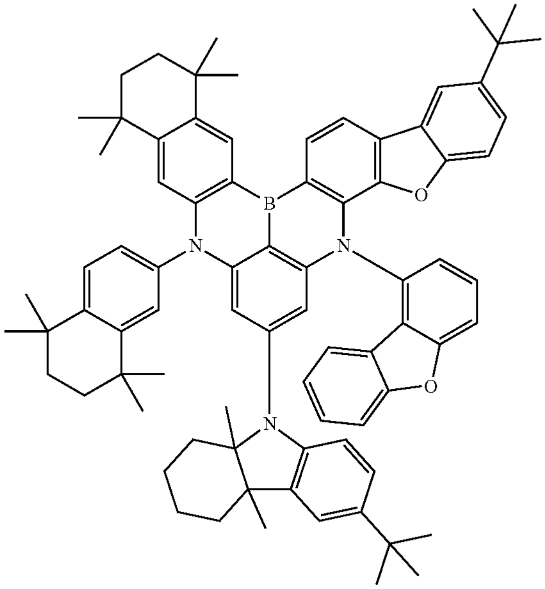
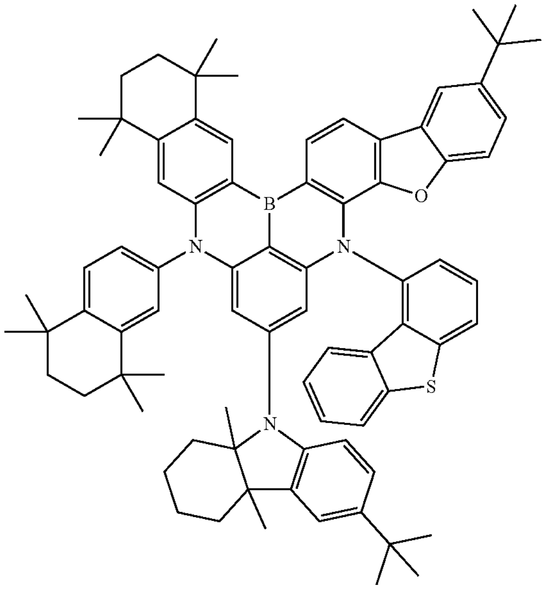
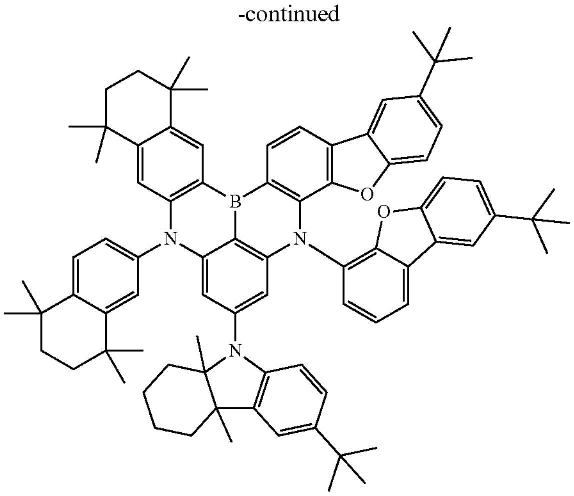
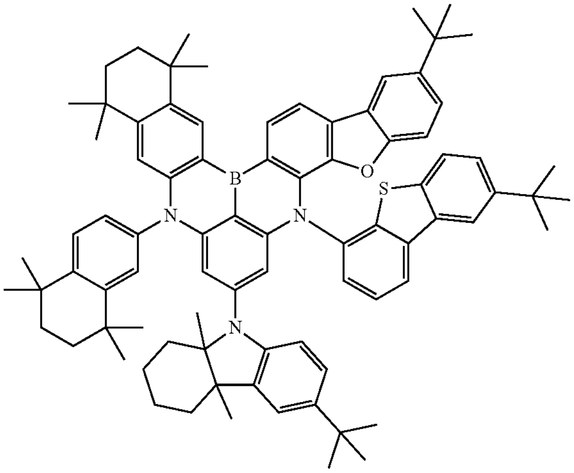
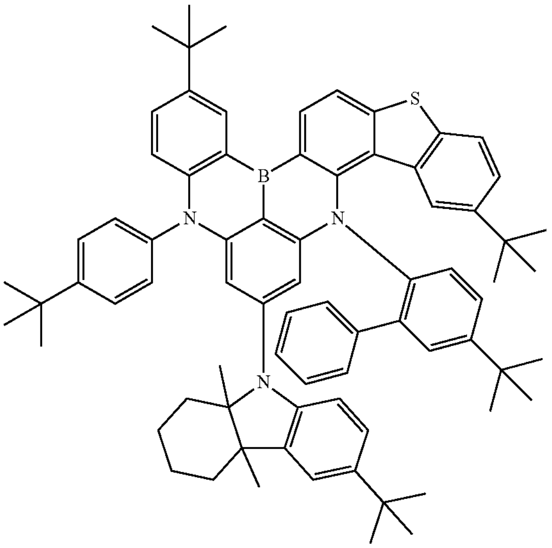

-continued
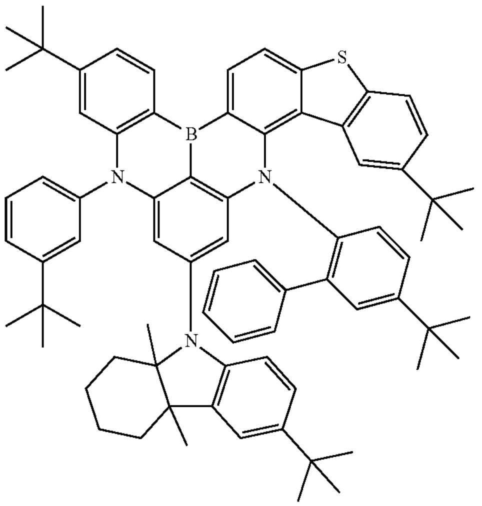
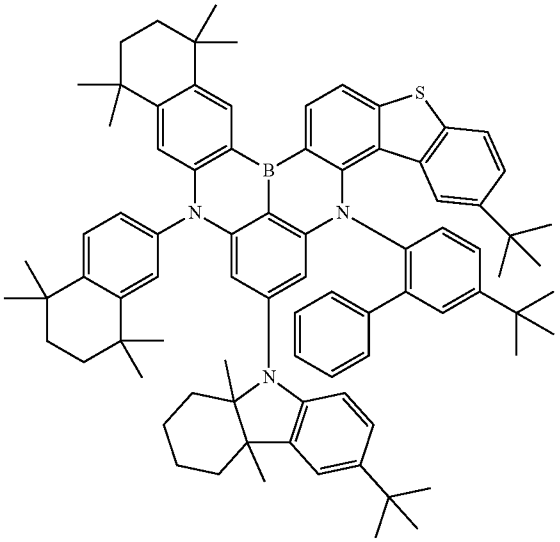
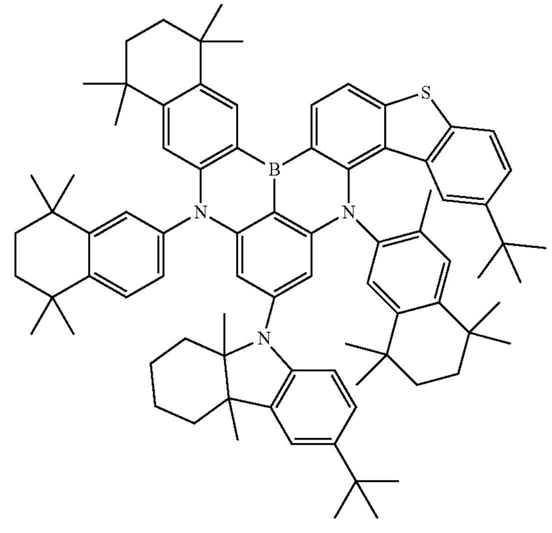
-continued
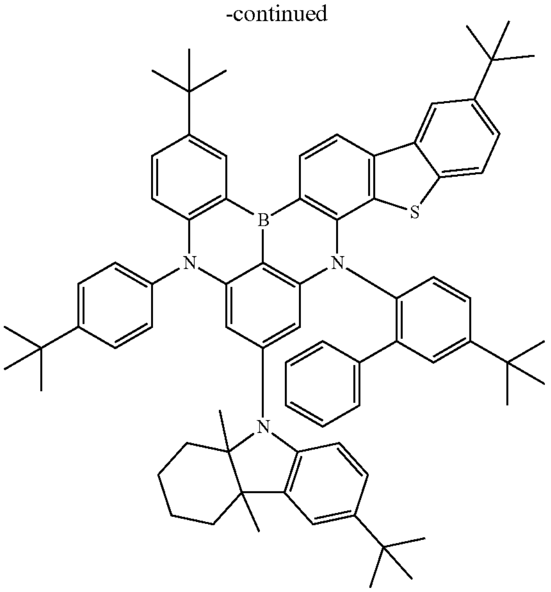
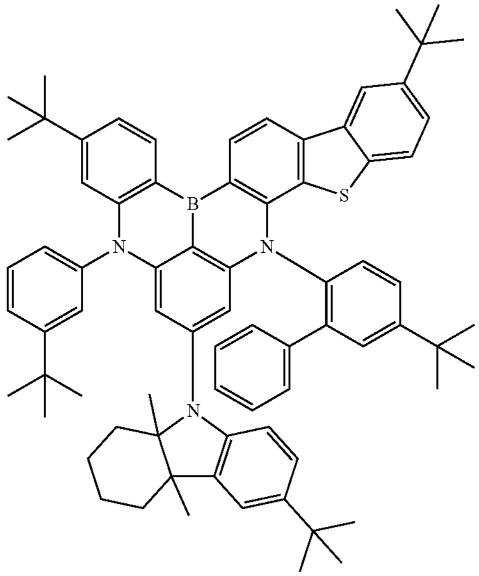
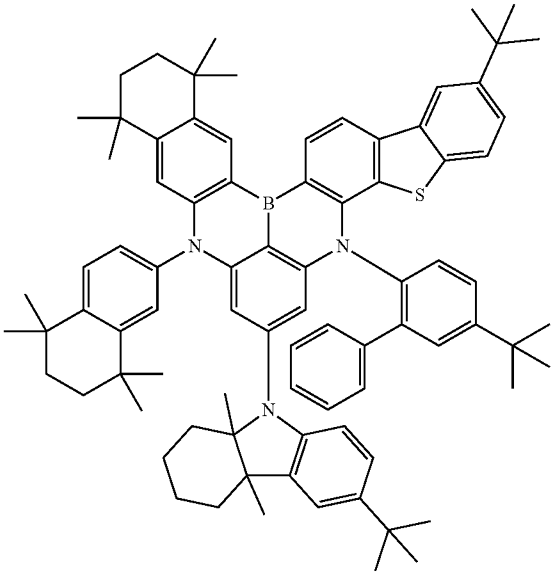

-continued
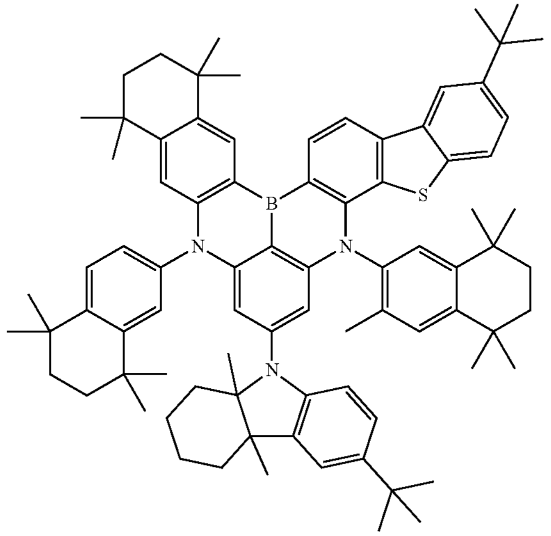
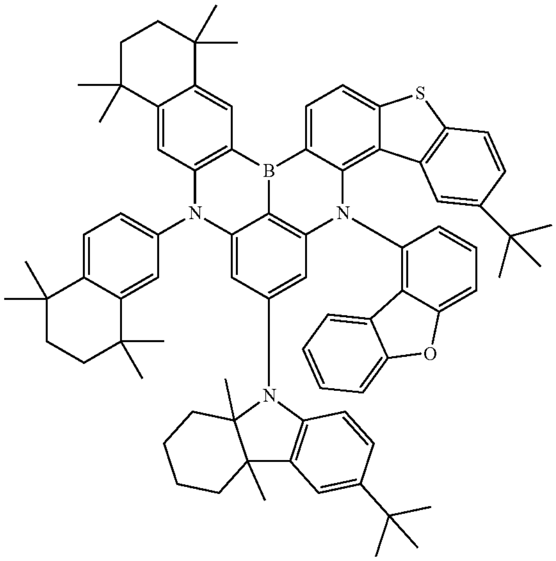
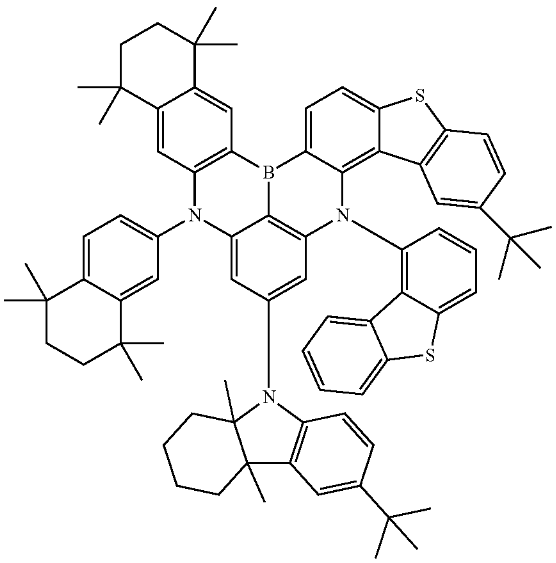
-continued
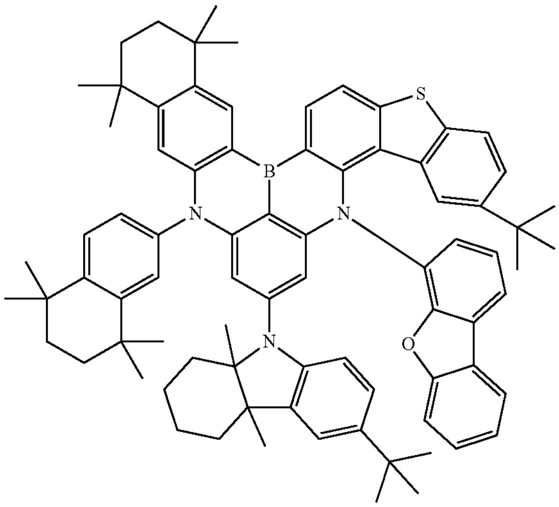
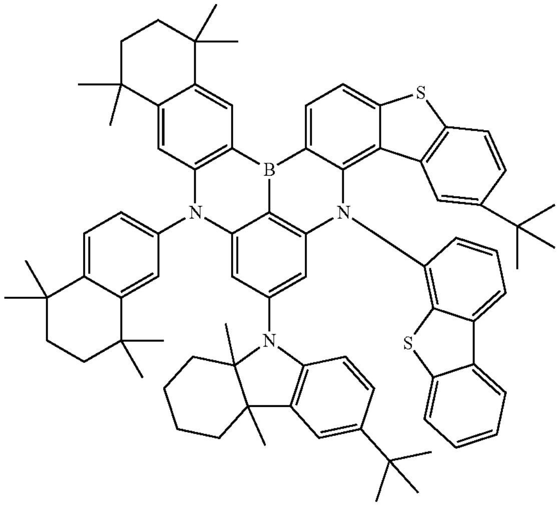
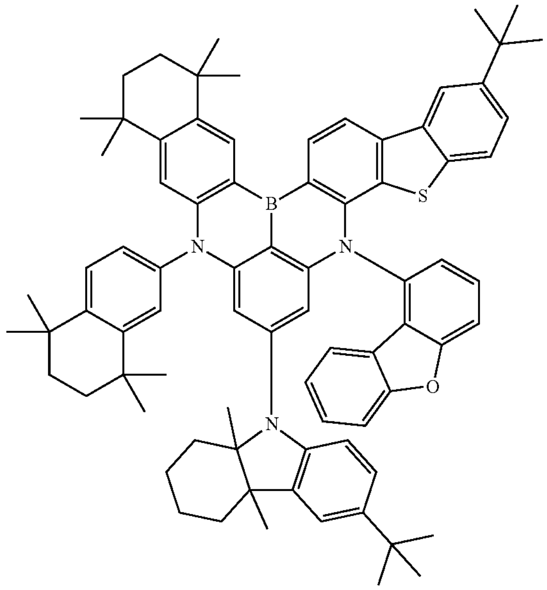

-continued
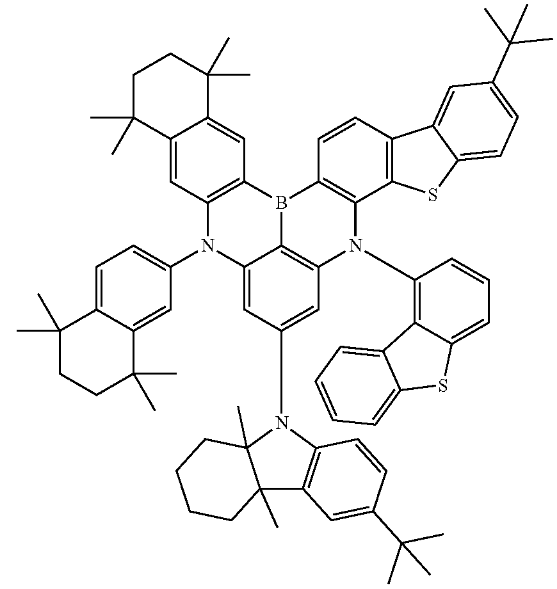
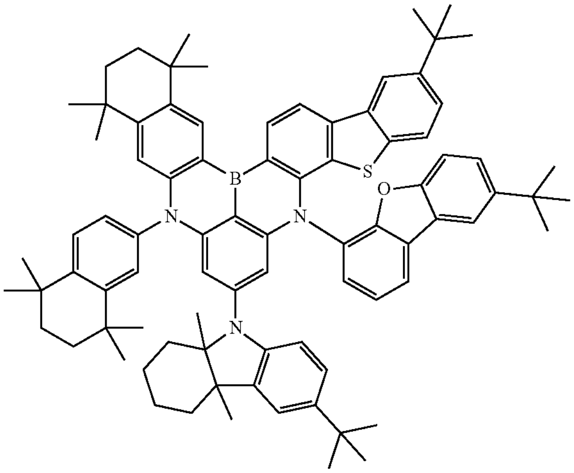
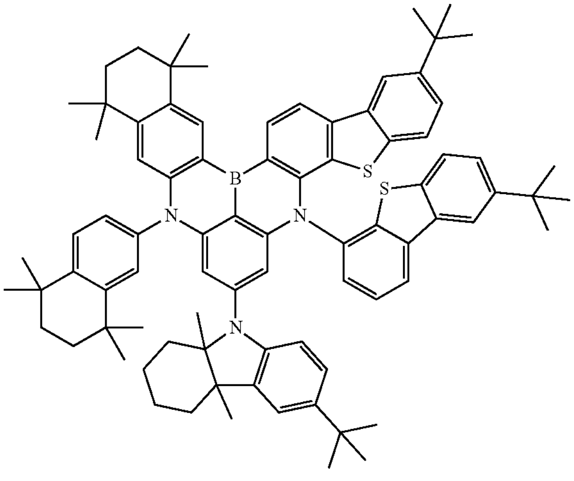
-continued
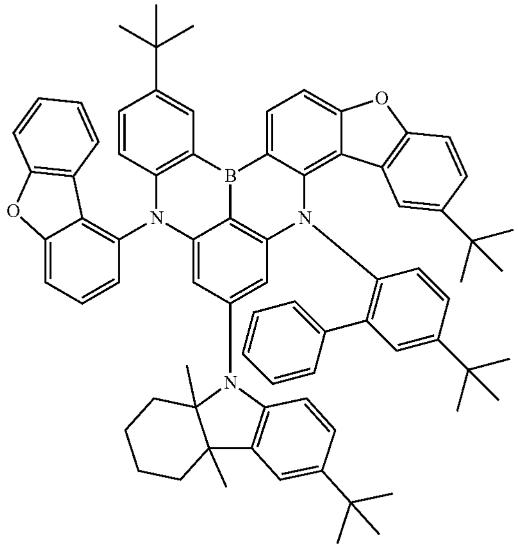
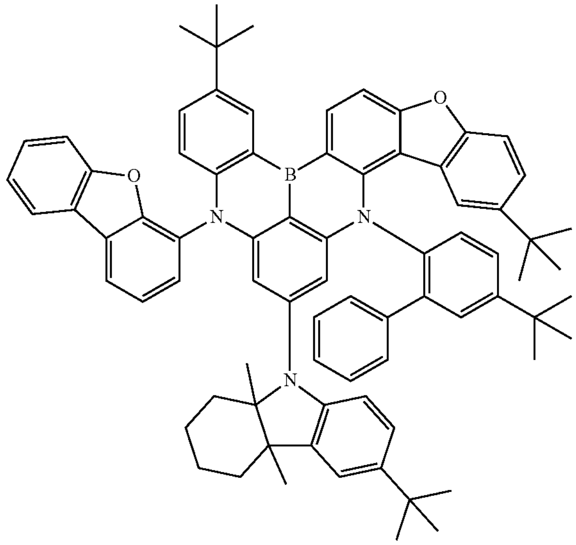
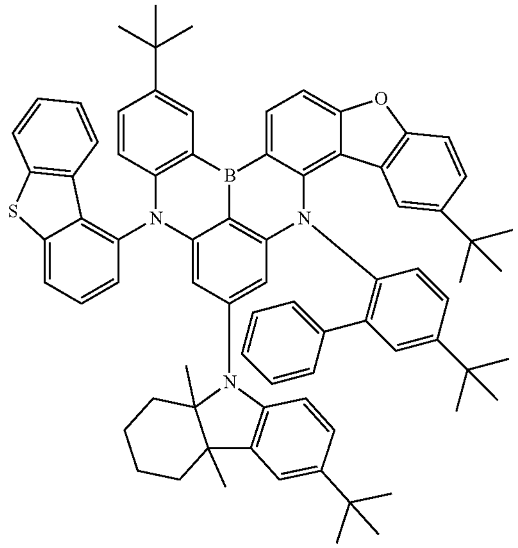

-continued
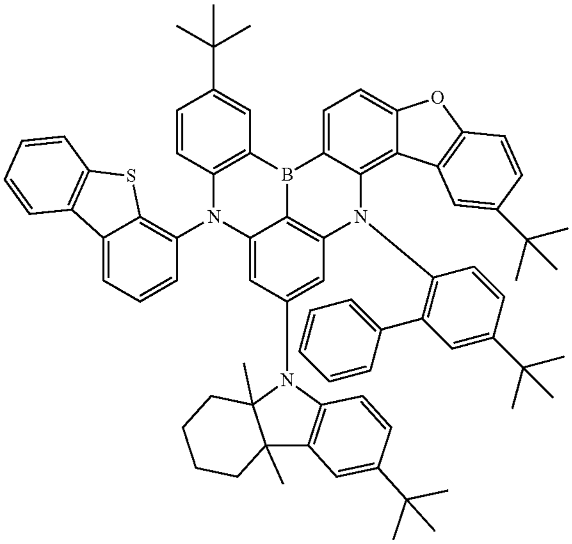
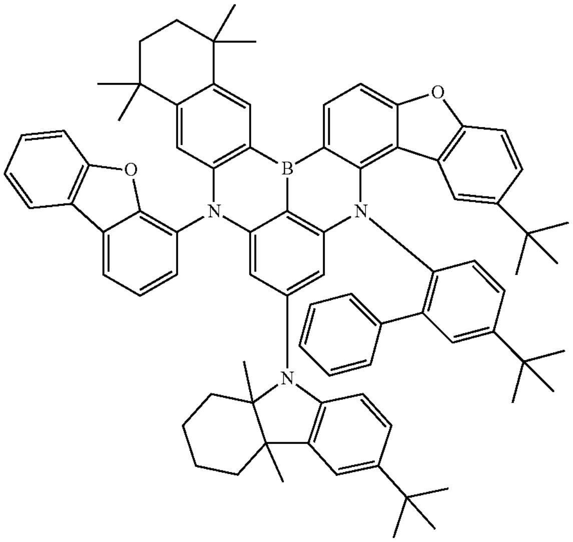
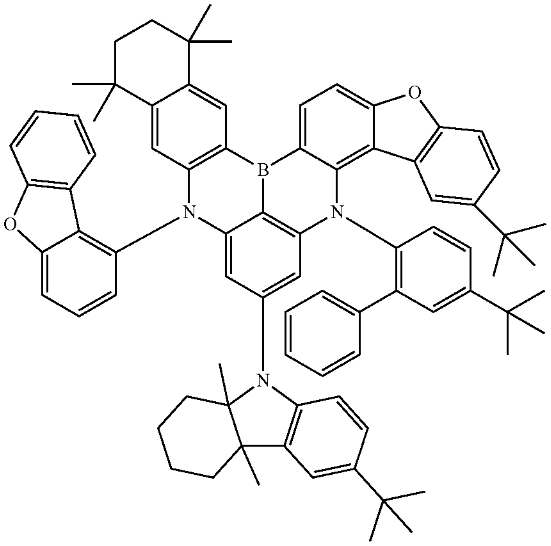
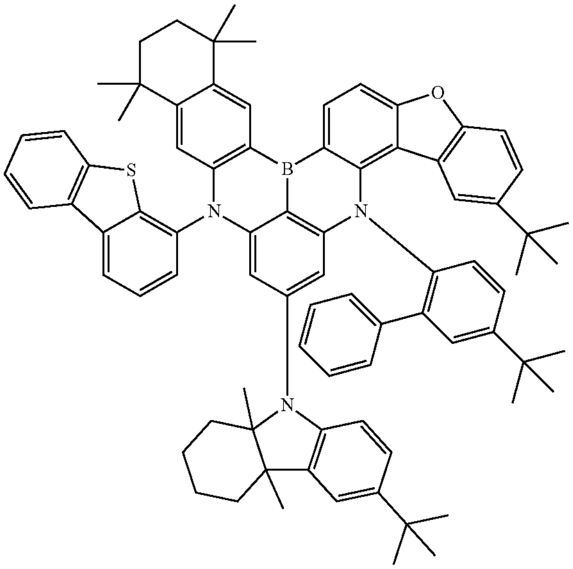
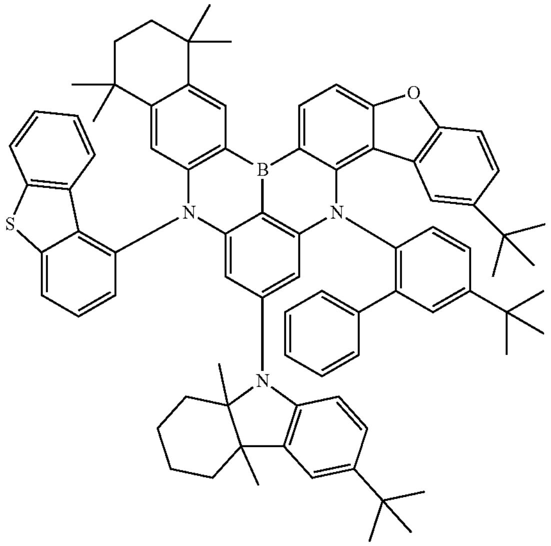
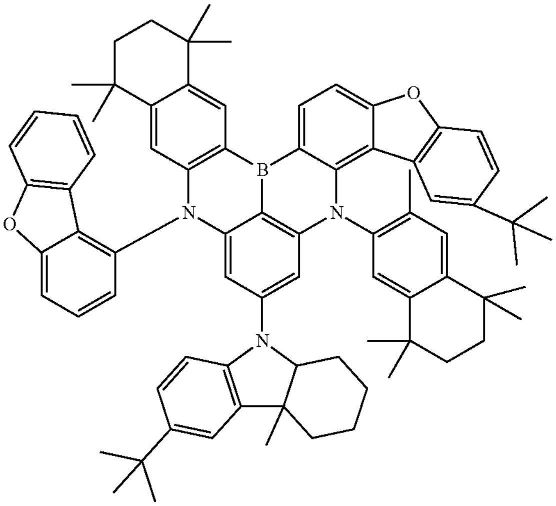
-continued -continued
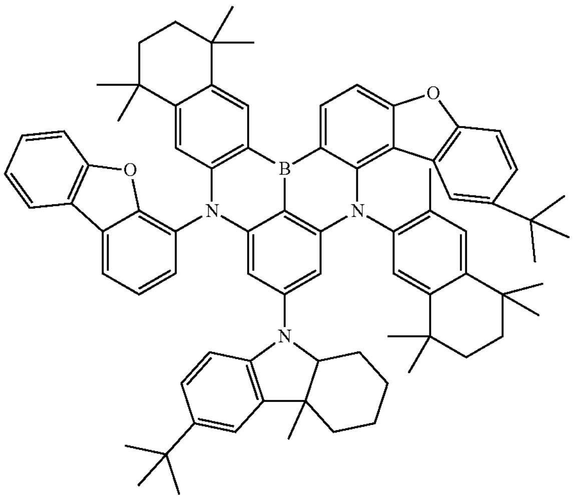
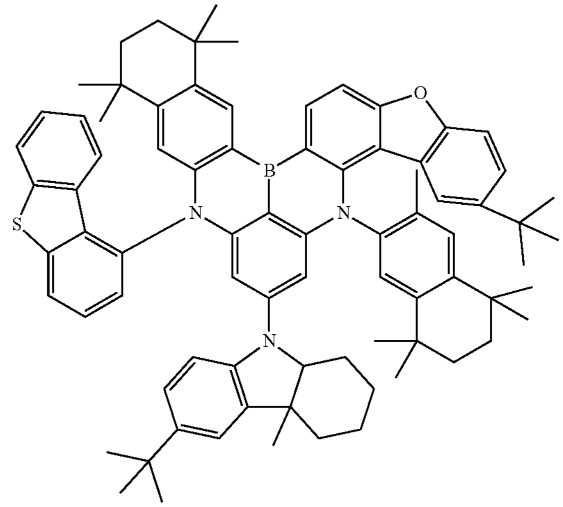
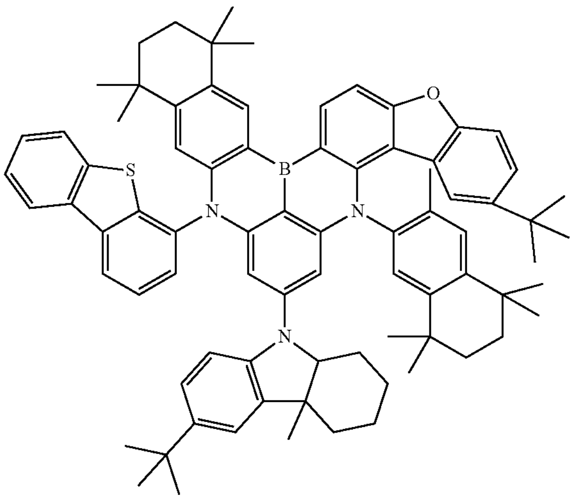
-continued
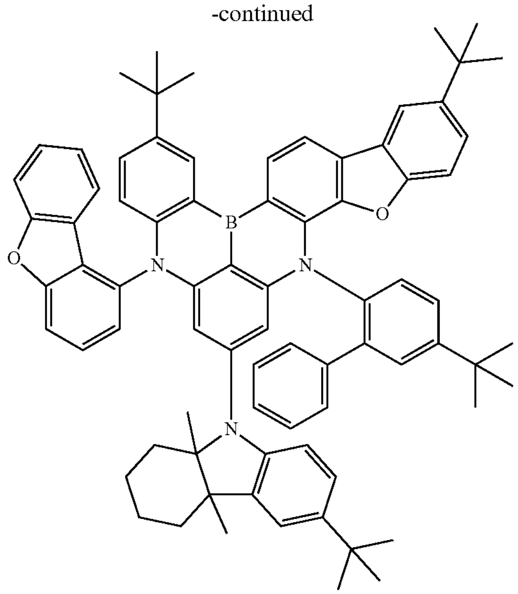
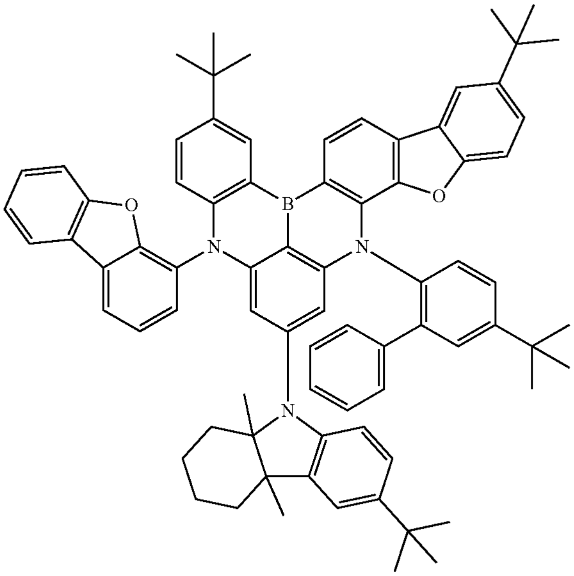
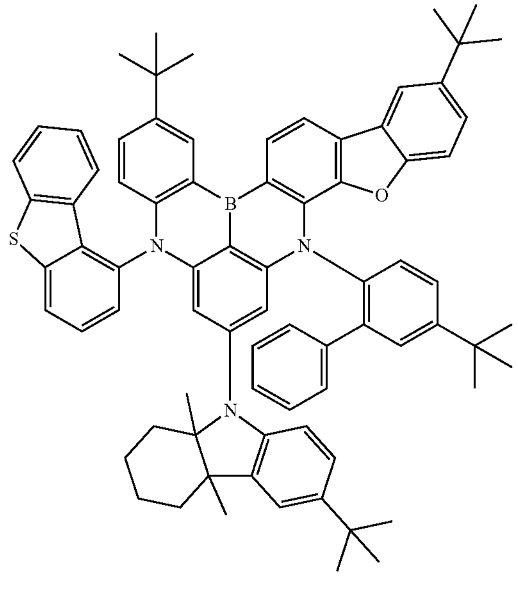

-continued
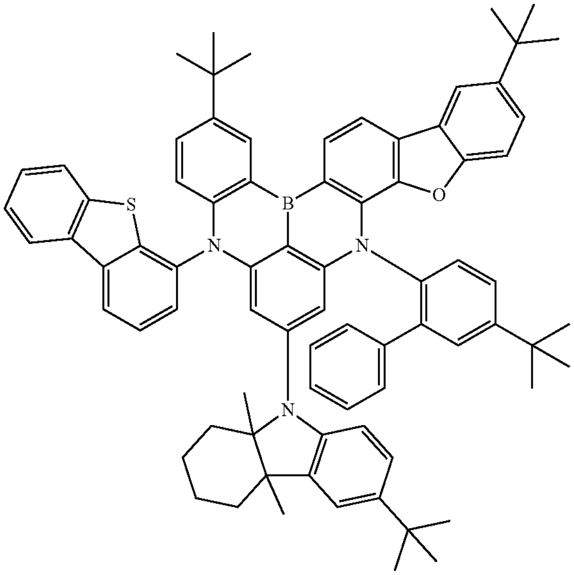
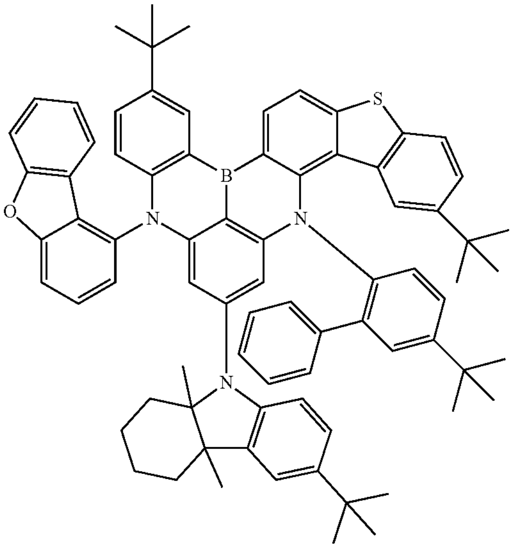
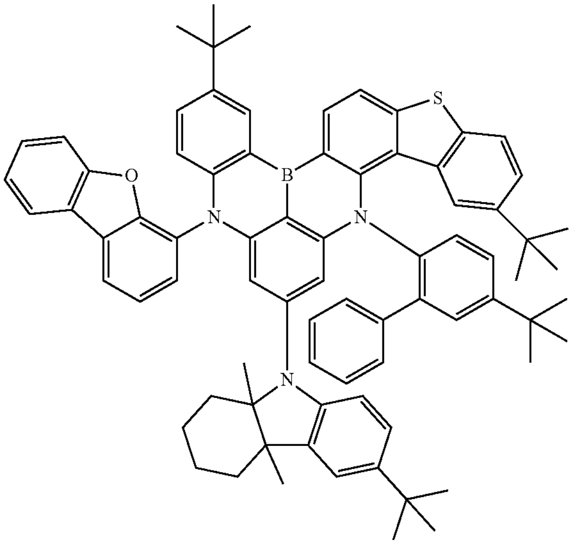
-continued
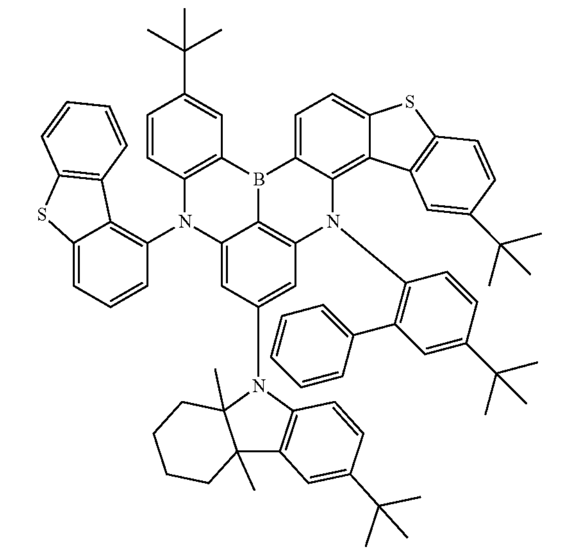
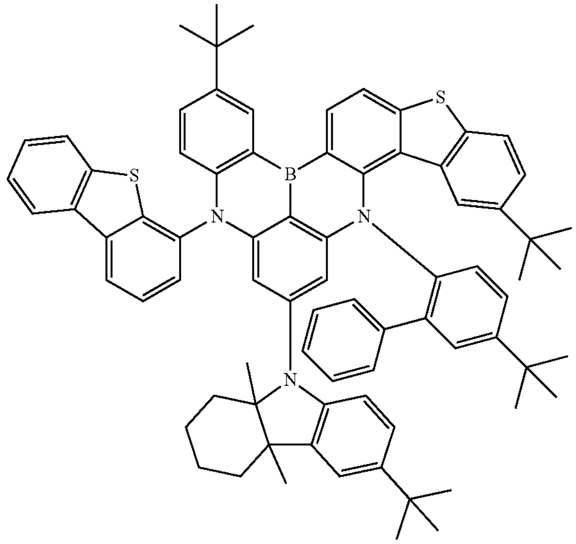
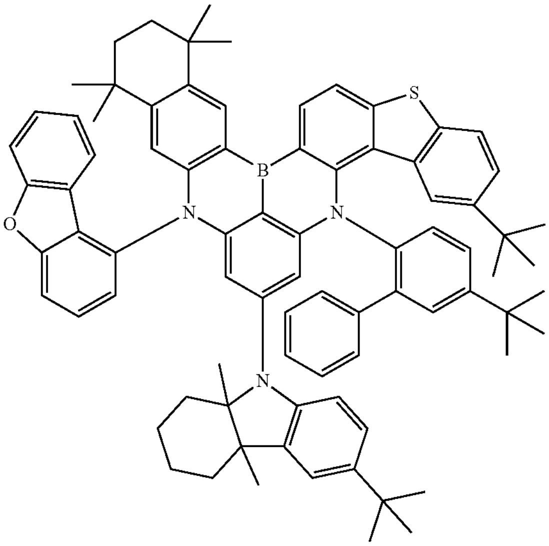

-continued
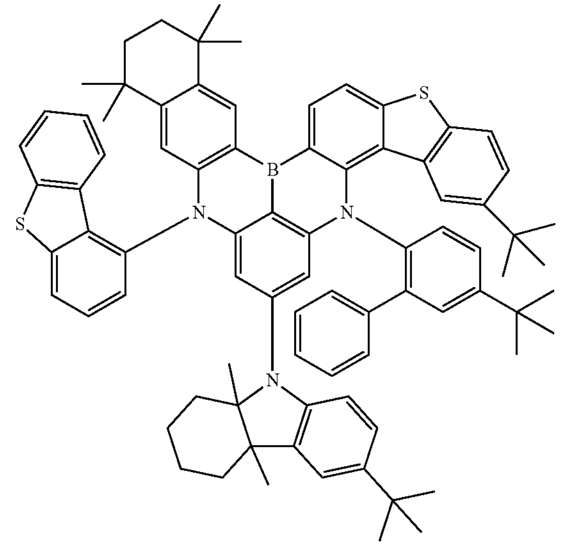
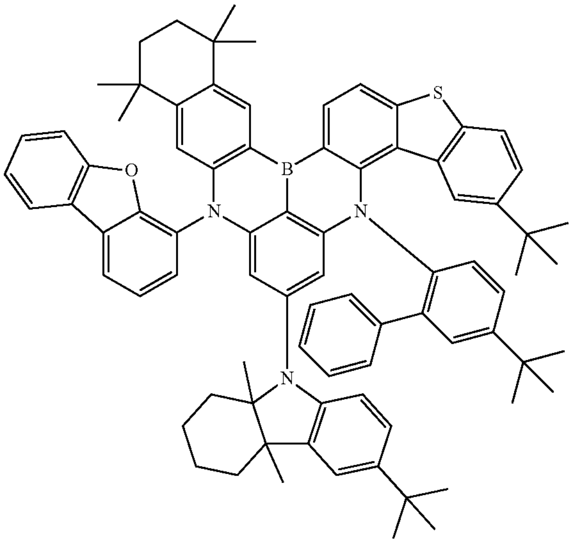
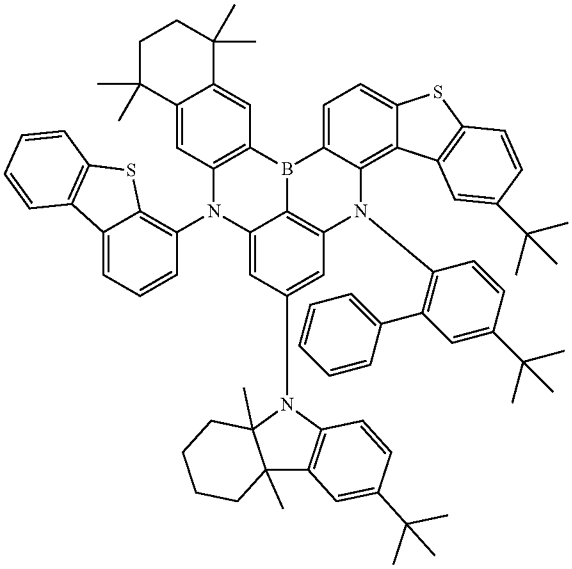
-continued
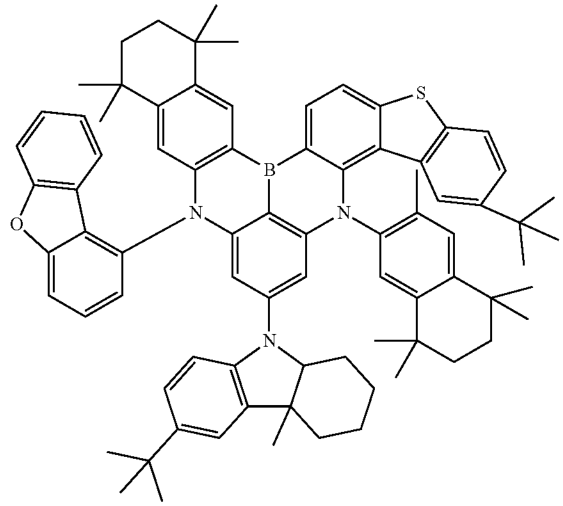
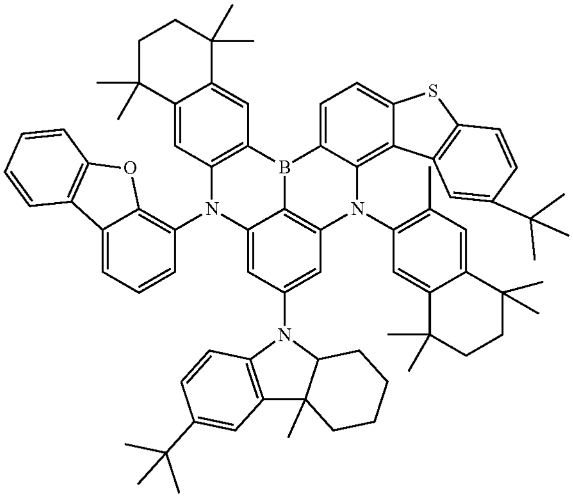
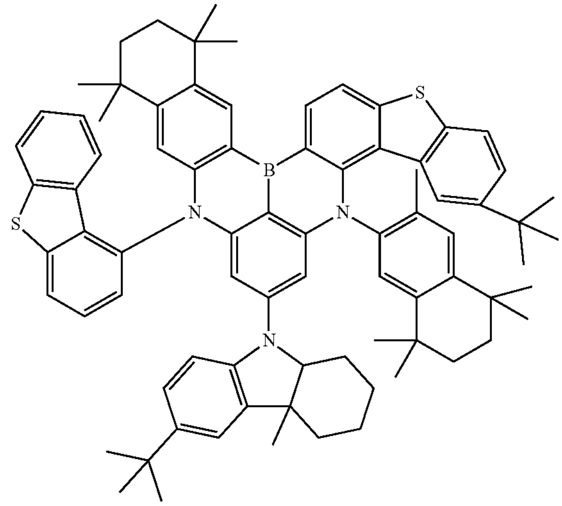

-continued
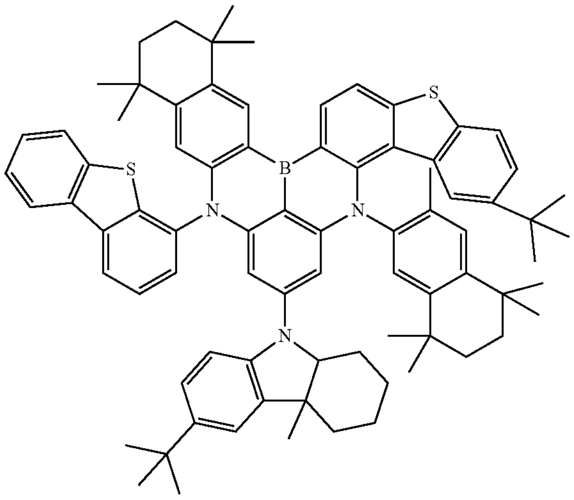
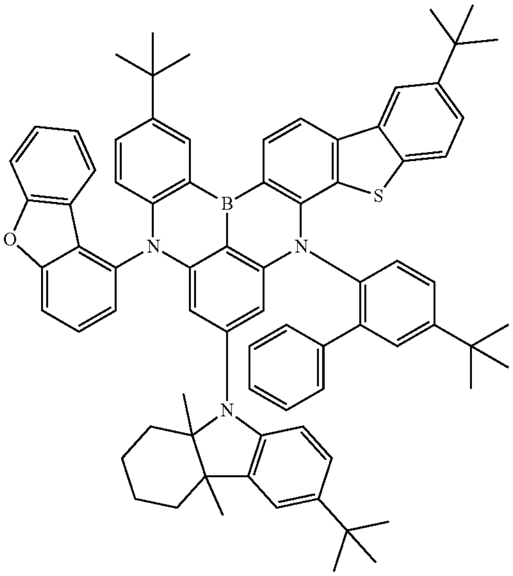
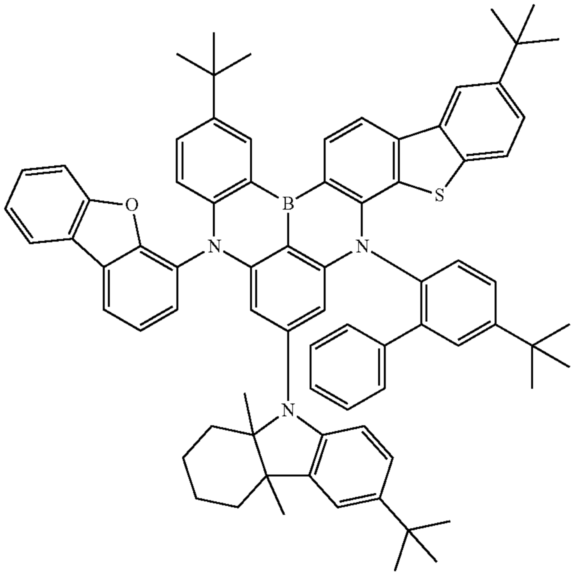
-continued
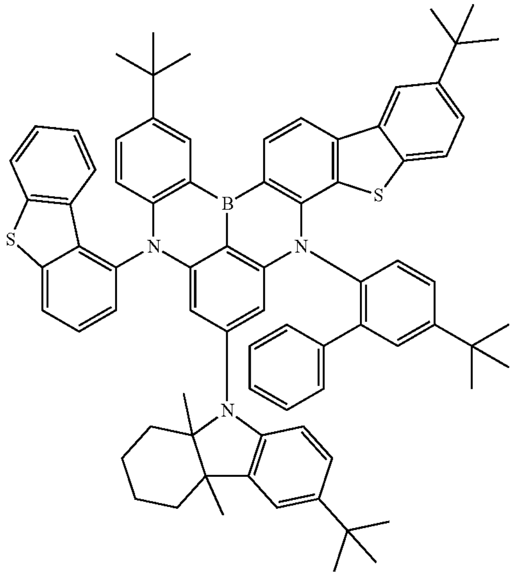
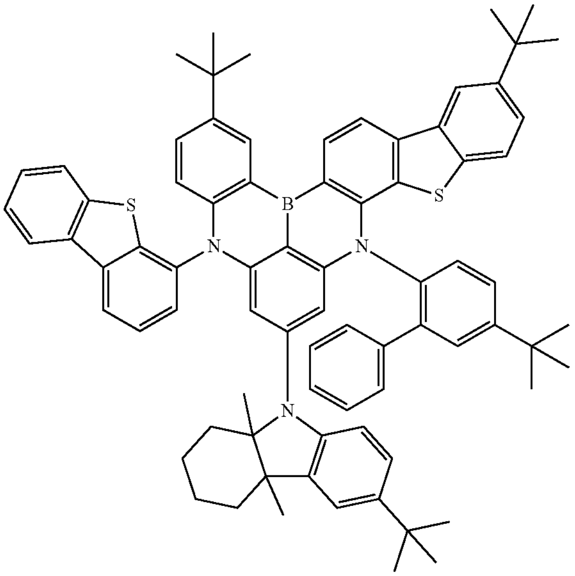

-continued
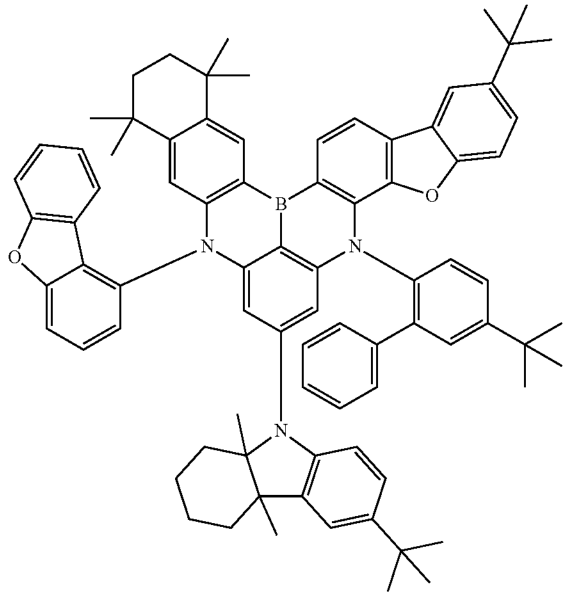
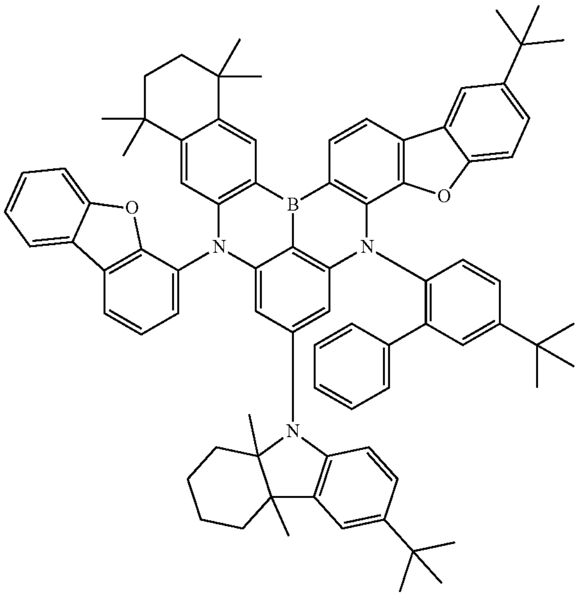
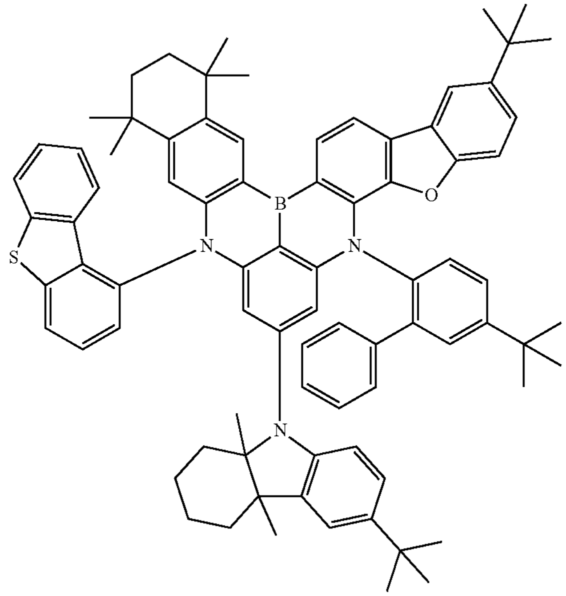
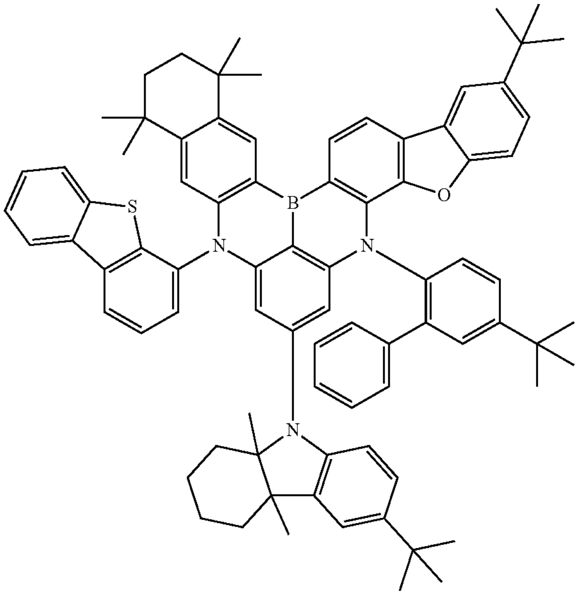

-continued
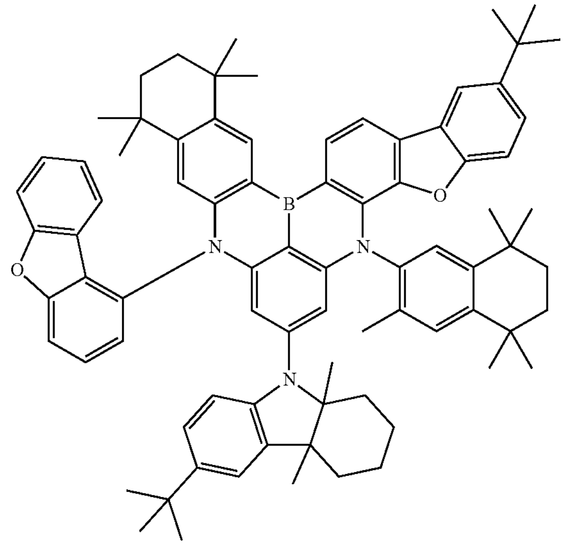
-continued
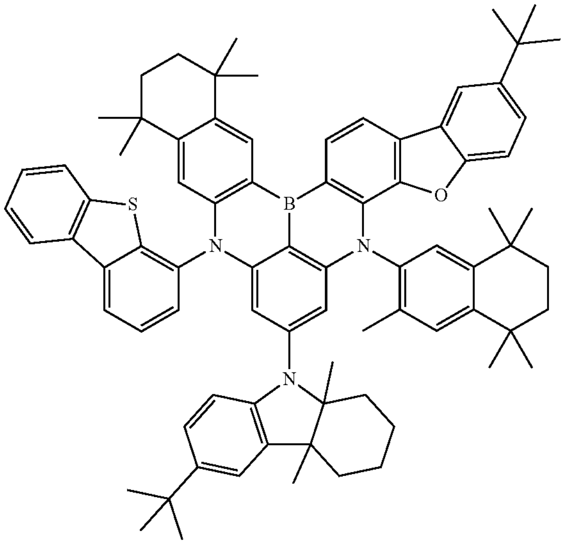
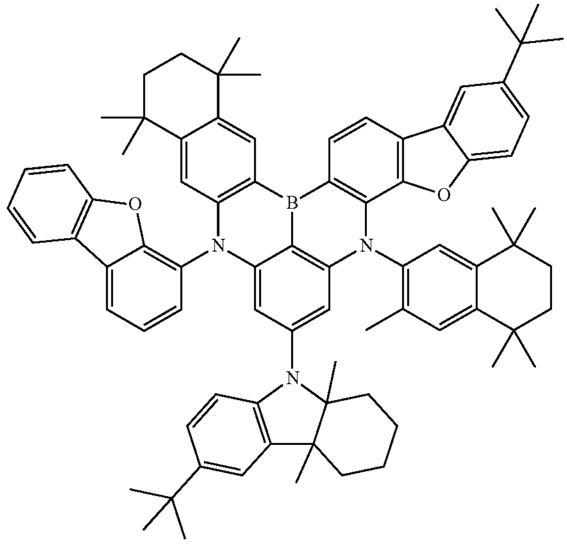
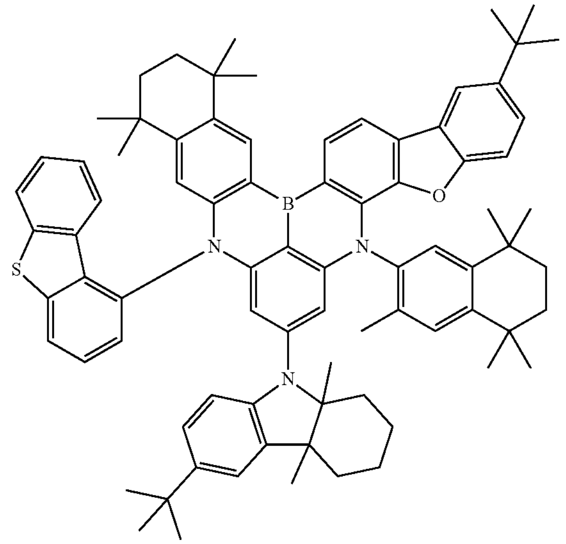
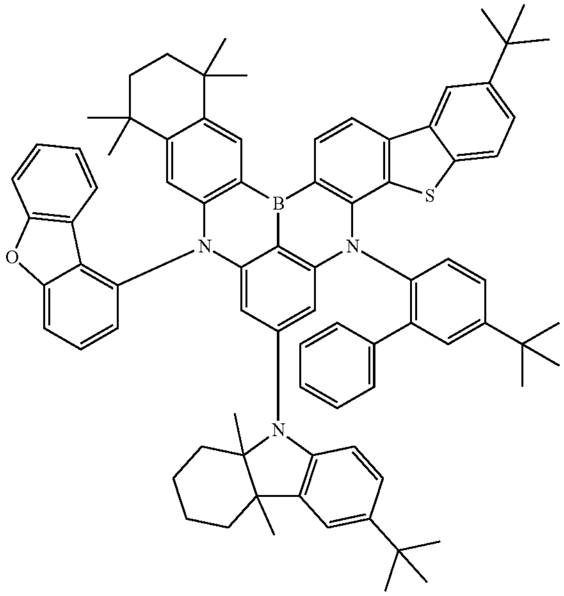

-continued
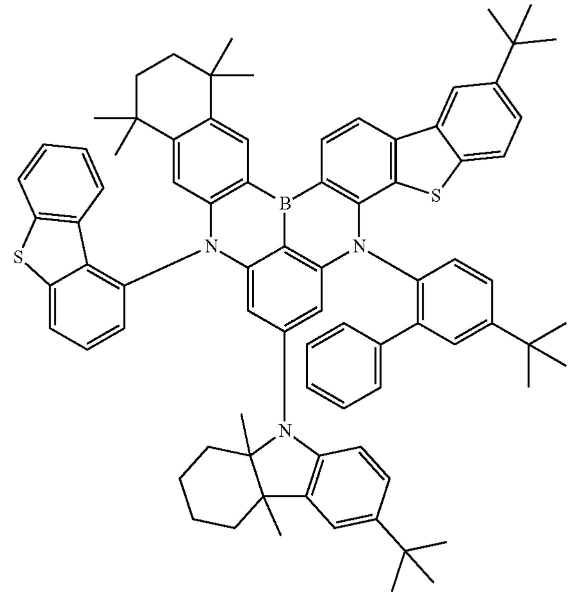
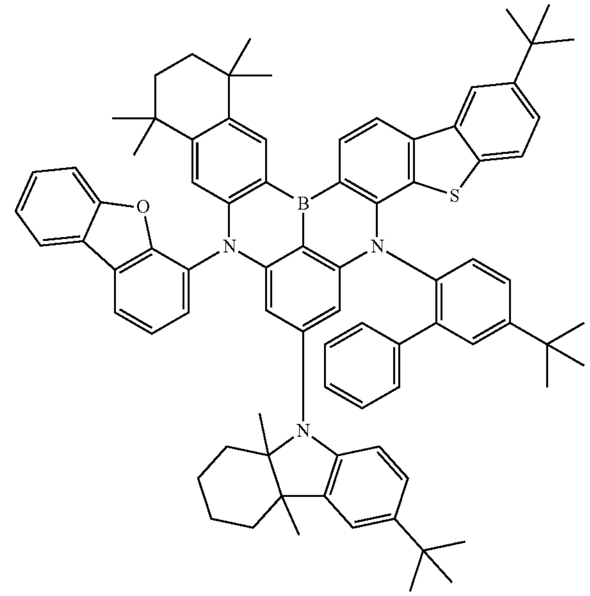
-continued
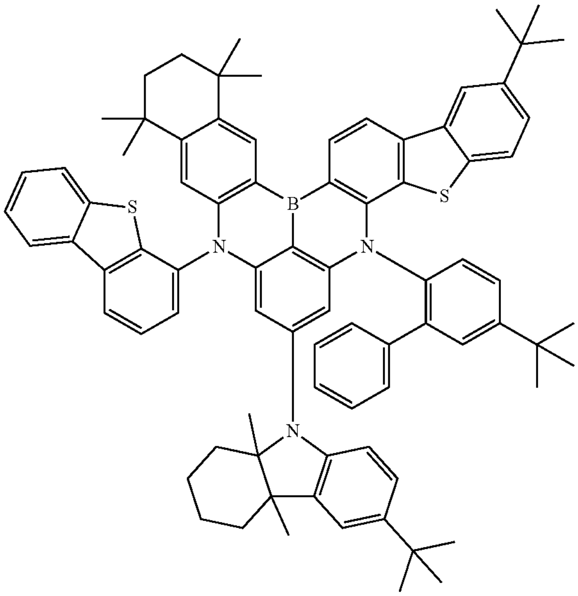
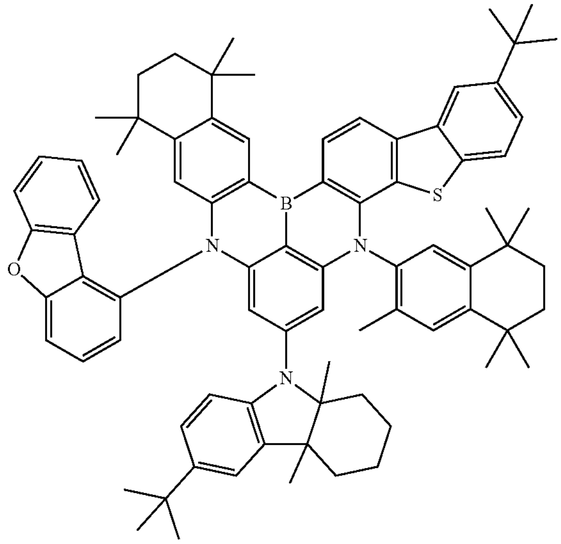
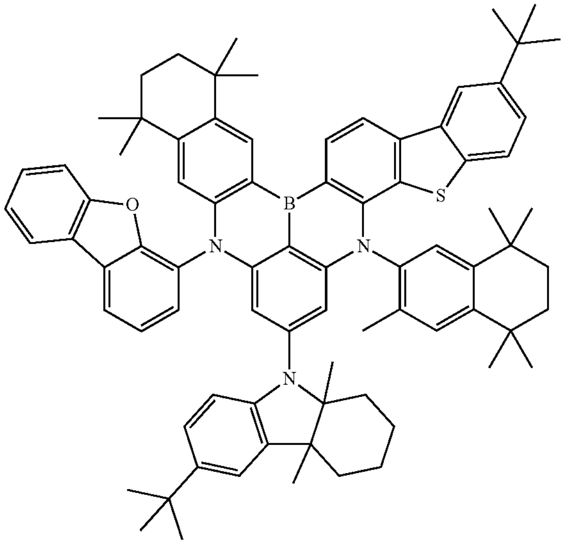

-continued
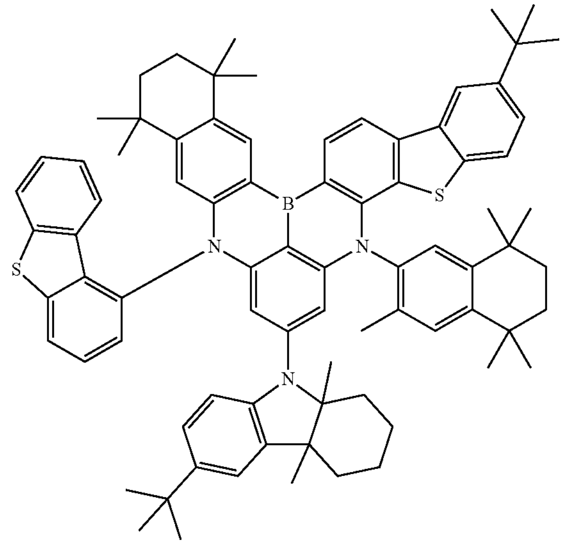
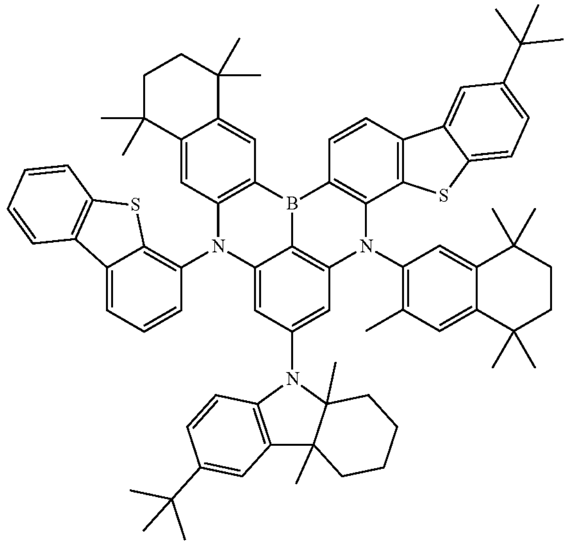
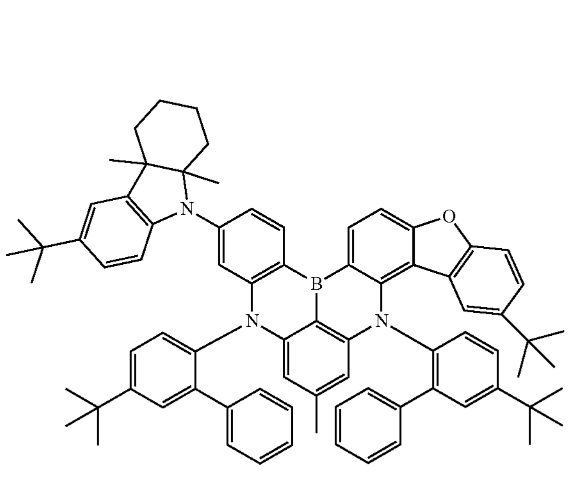
-continued
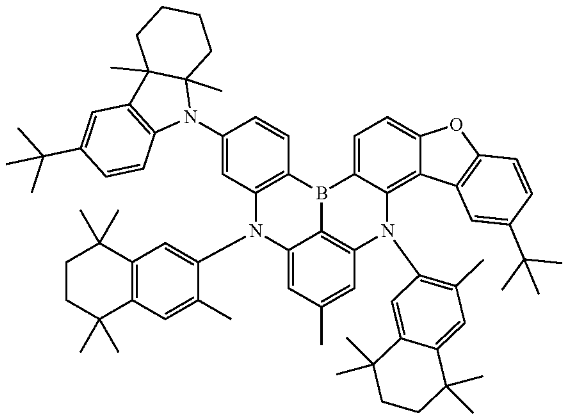
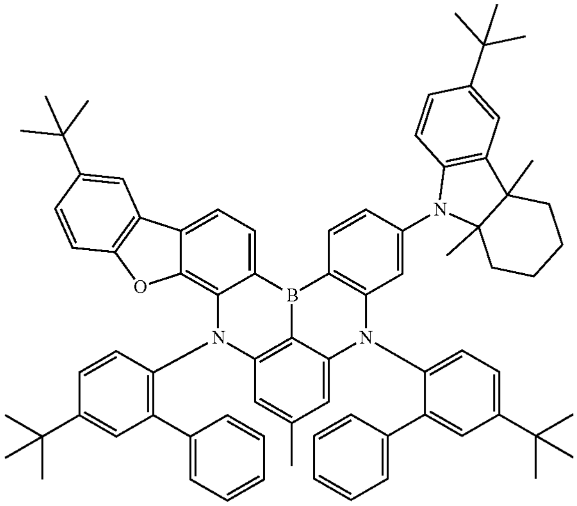
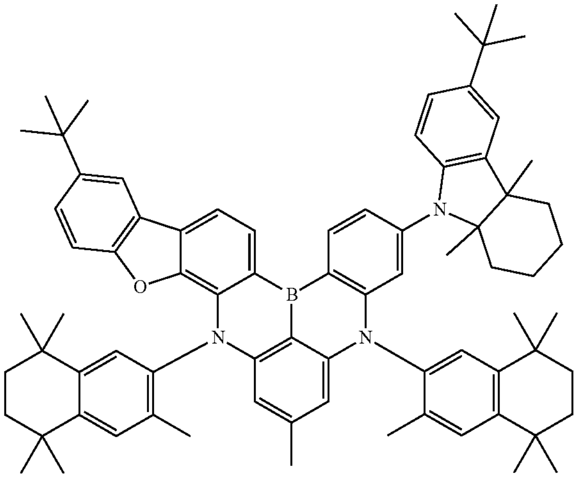 [SMILES: Cc1cc2c3c(c1)N(c1cc4c(cc1C)C(C)(C)CCC4(C)C)c1c(ccc4c1oc1ccc(C(C)(C)C)cc14)B3c1ccc(N3c4ccc(C(C)(C)C)cc4C4(C)CCCCC34C)cc1N2c1cc2c(cc1C)C(C)(C)CCC2(C)C]

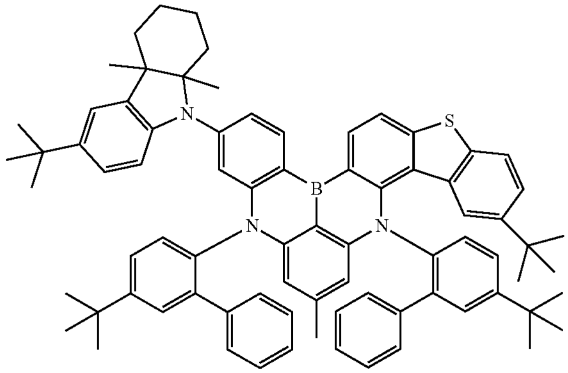
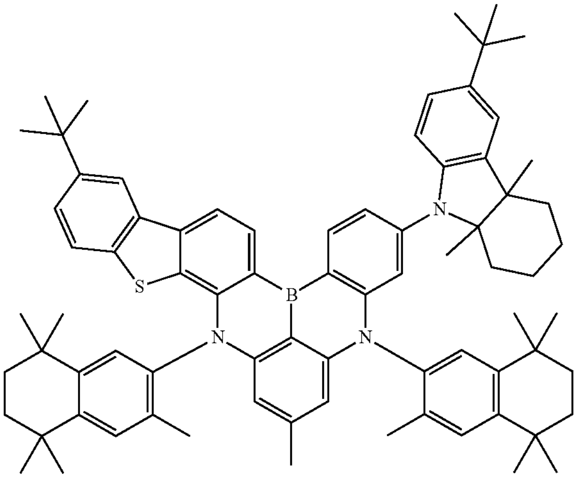
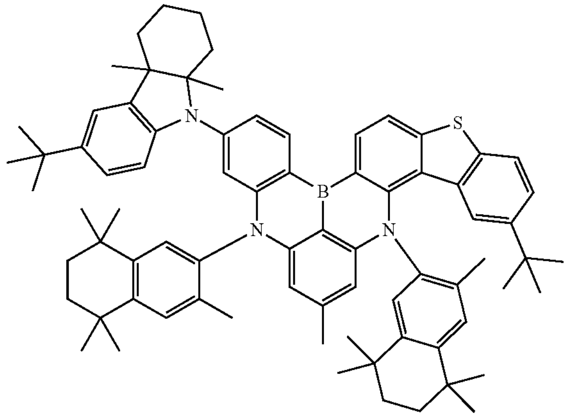
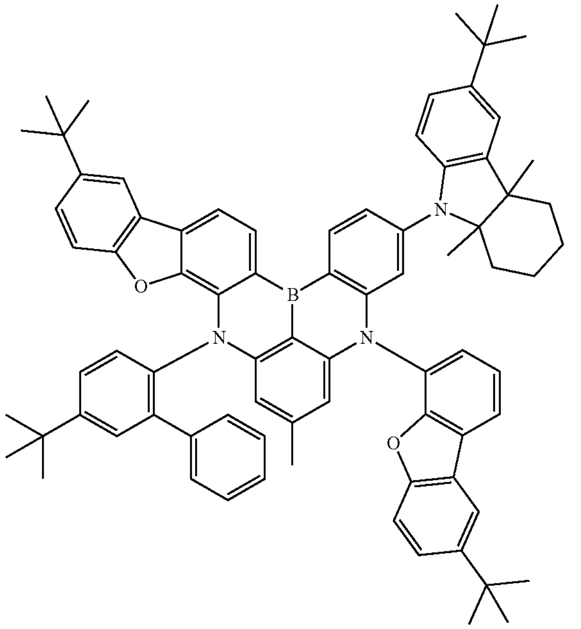
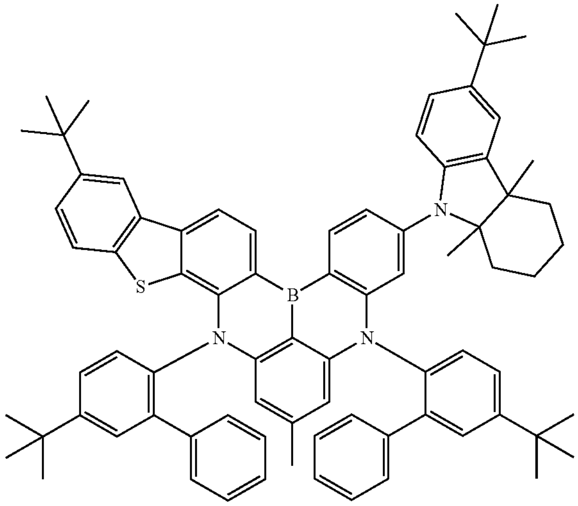
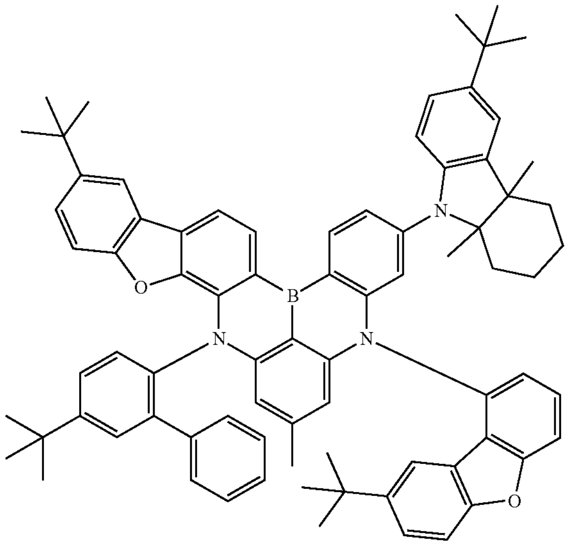

-continued
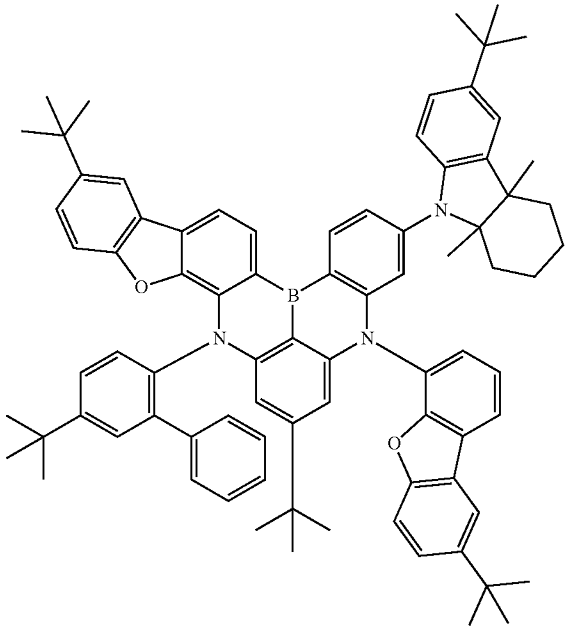
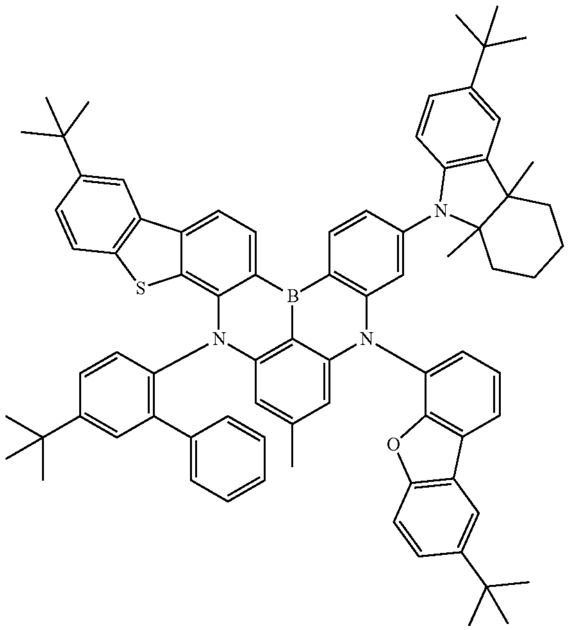
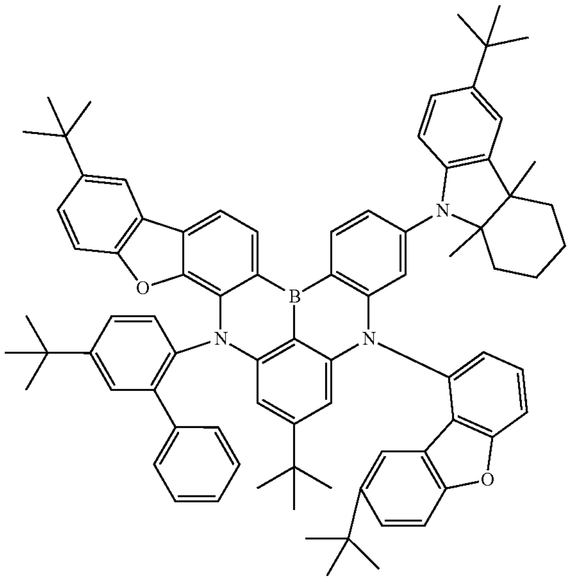
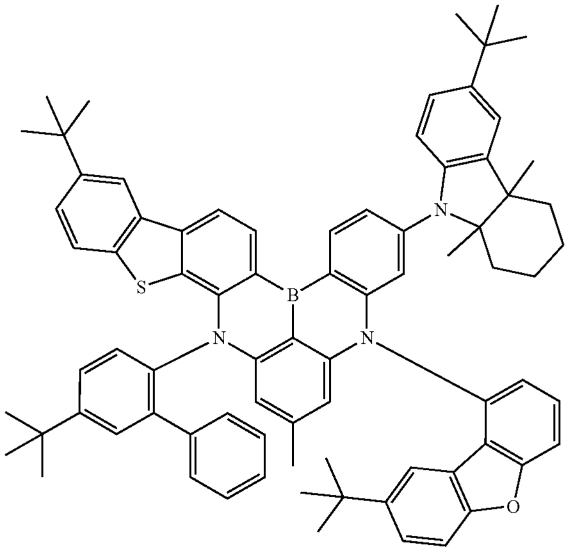
-continued

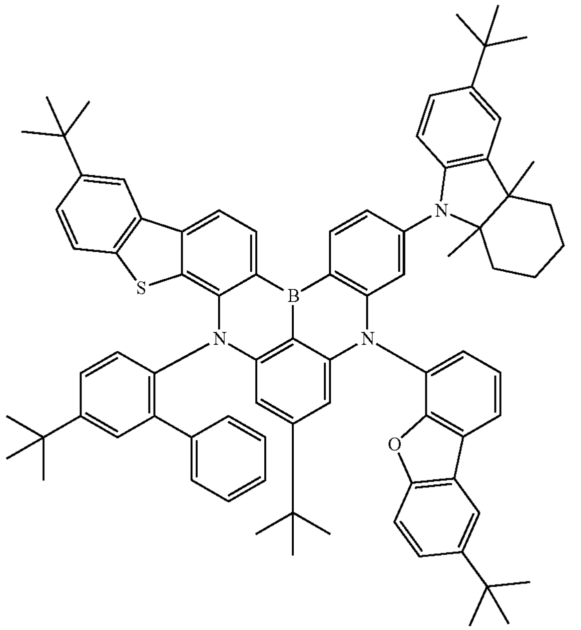
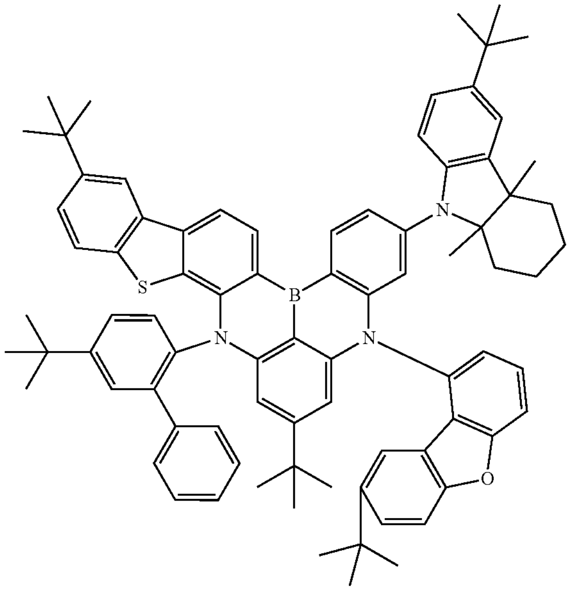
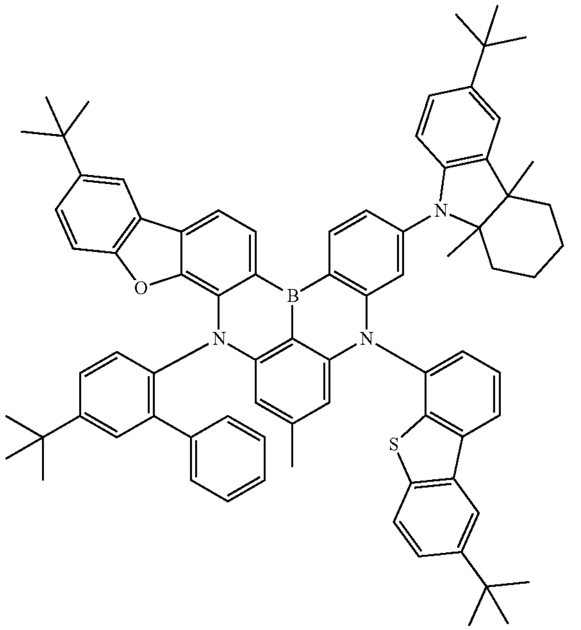
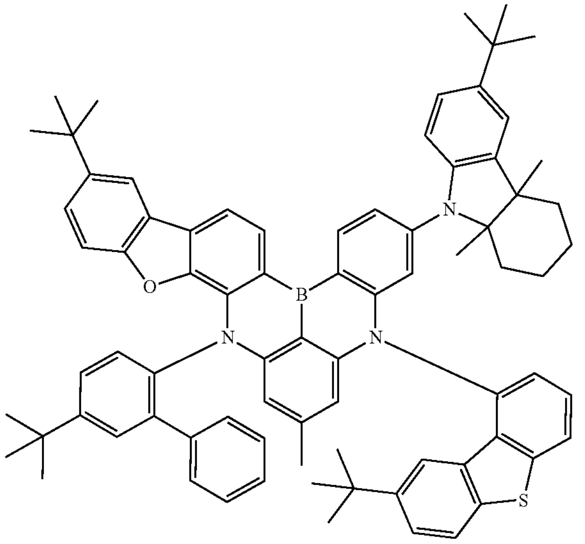

-continued
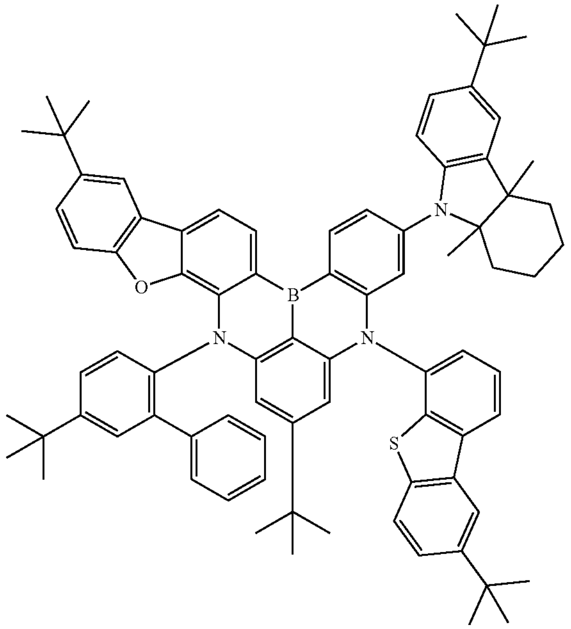
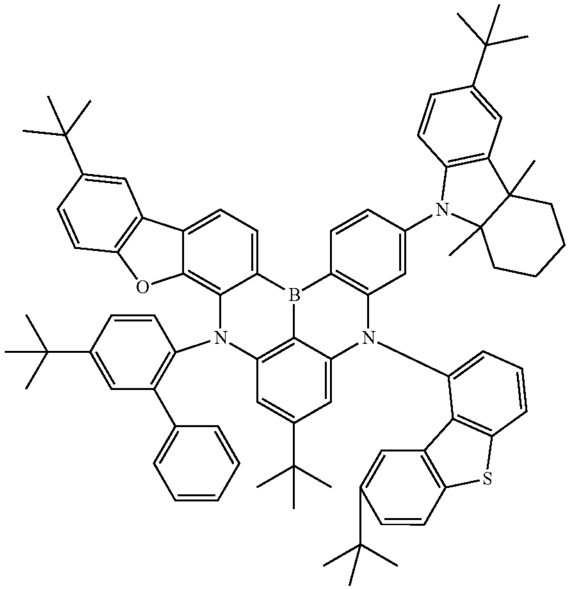
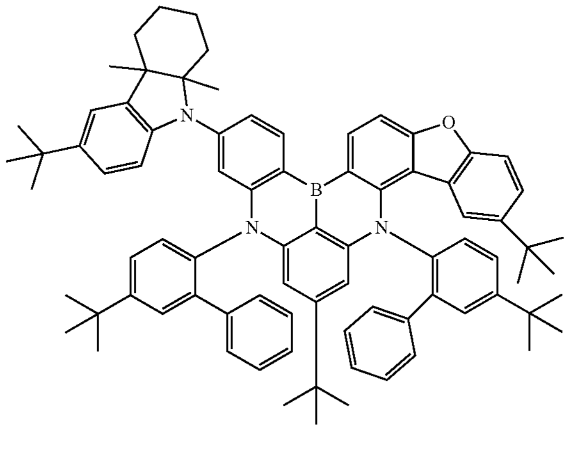
-continued
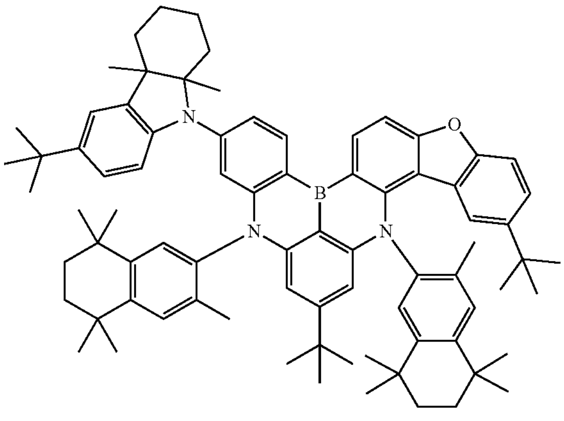
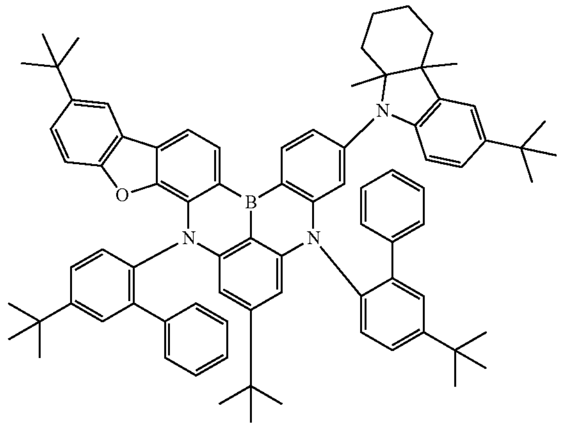
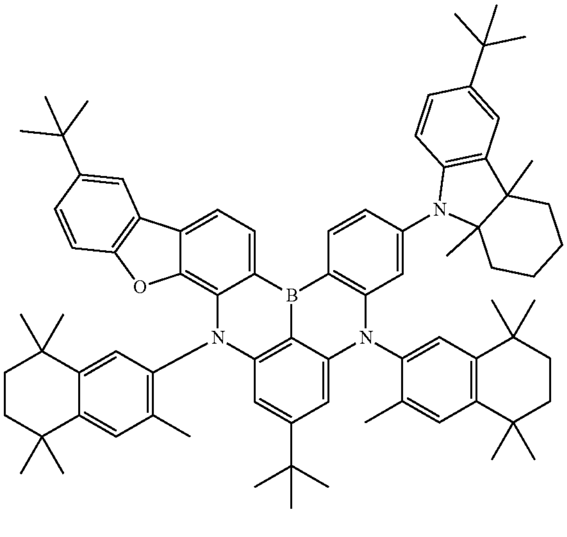 [SMILES: Cc1cc2c(cc1N1c3cc(N4c5ccc(C(C)(C)C)cc5C5(C)CCCCC45C)ccc3B3c4ccc5c(oc6ccc(C(C)(C)C)cc65)c4N(c4cc5c(cc4C)C(C)(C)CCC5(C)C)c4cc(C(C)(C)C)cc1c43)C(C)(C)CCC2(C)C]

-continued
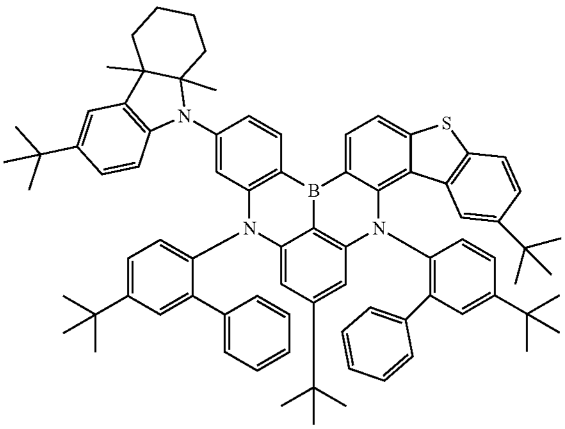
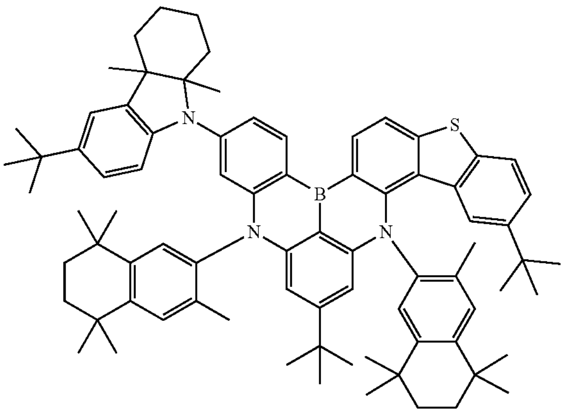
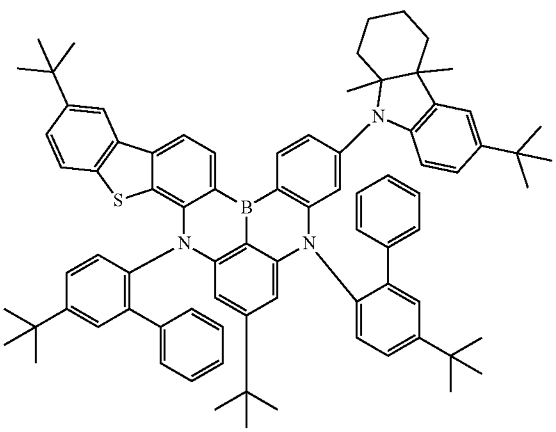
-continued
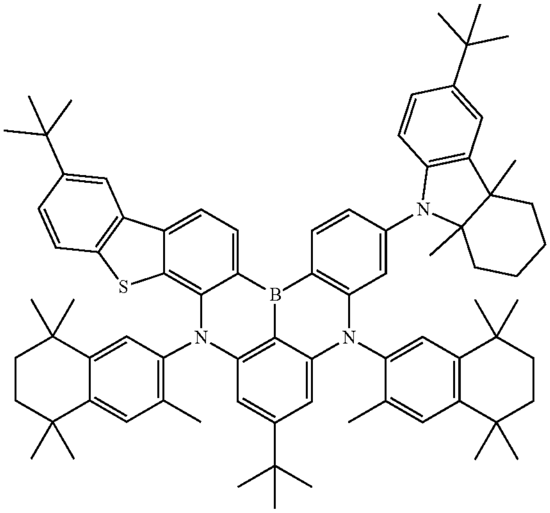
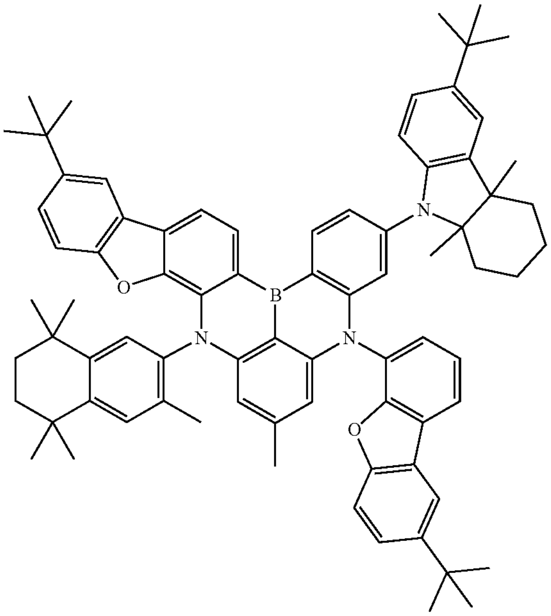
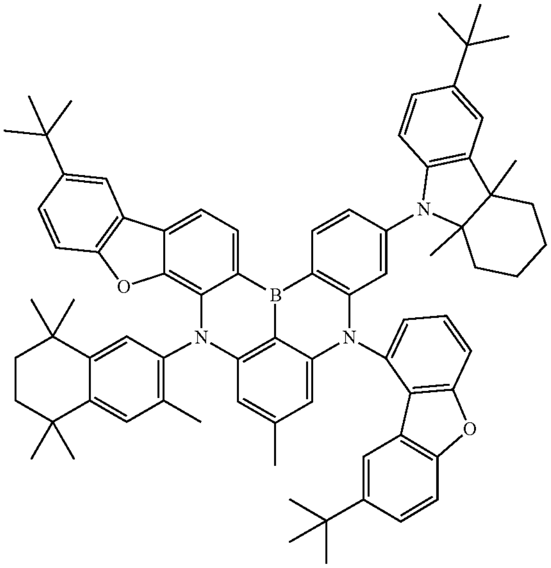

-continued
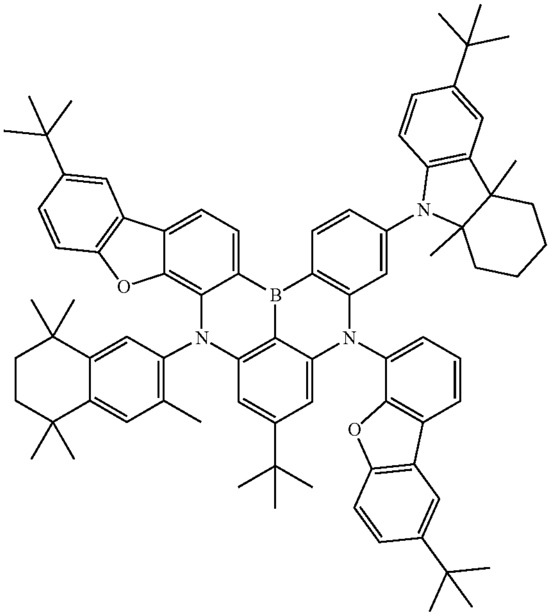
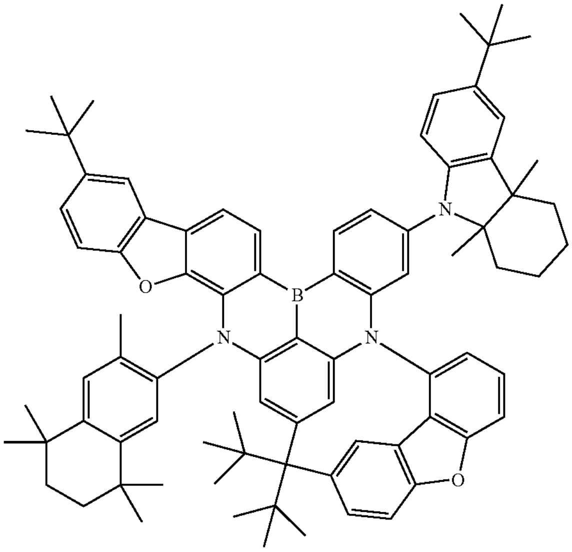
-continued
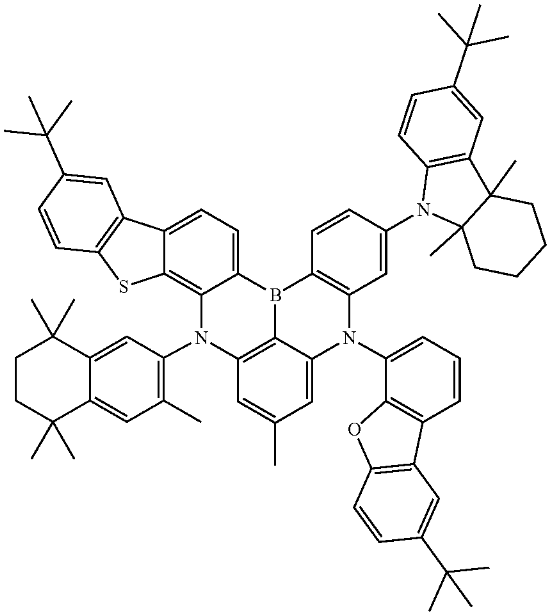
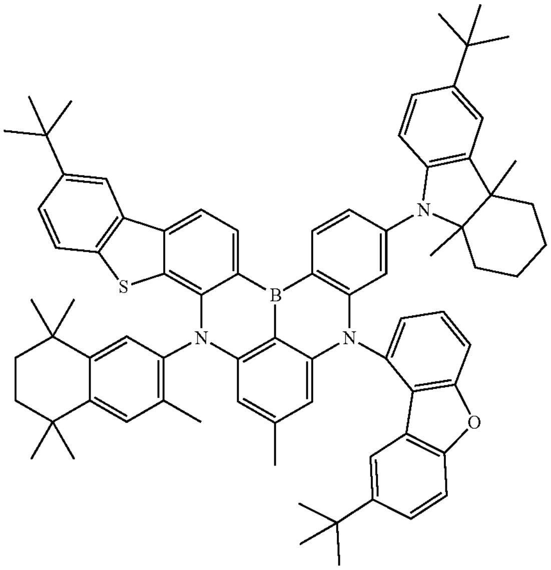

-continued
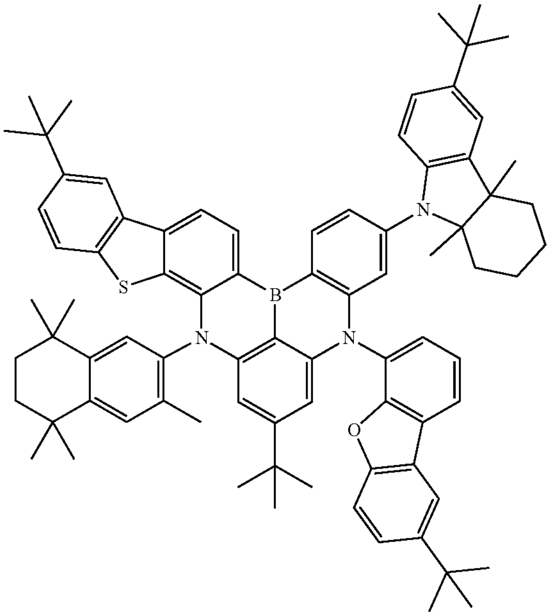
-continued
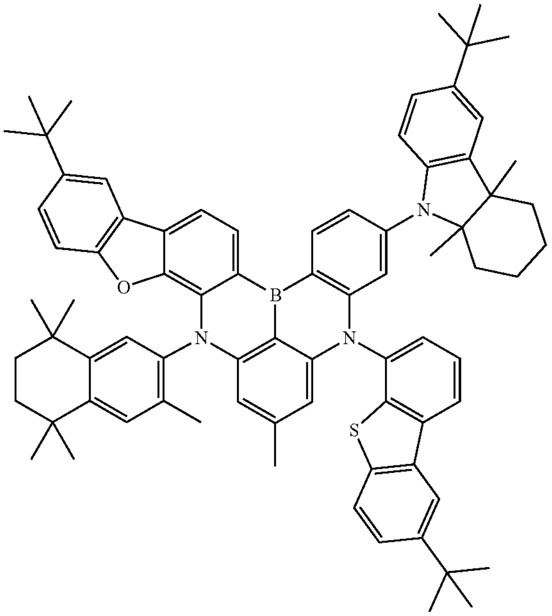
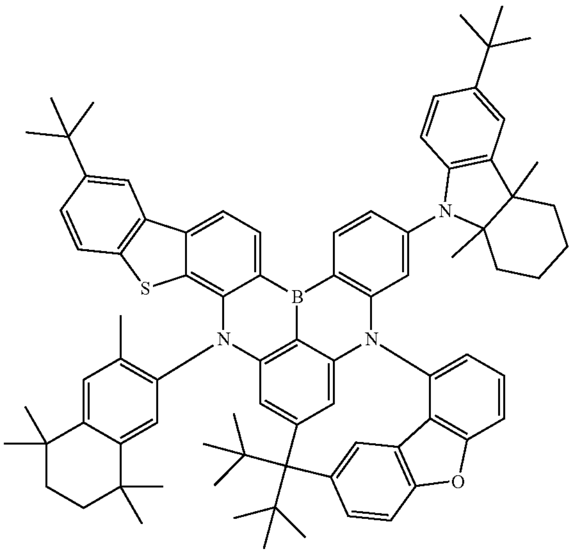
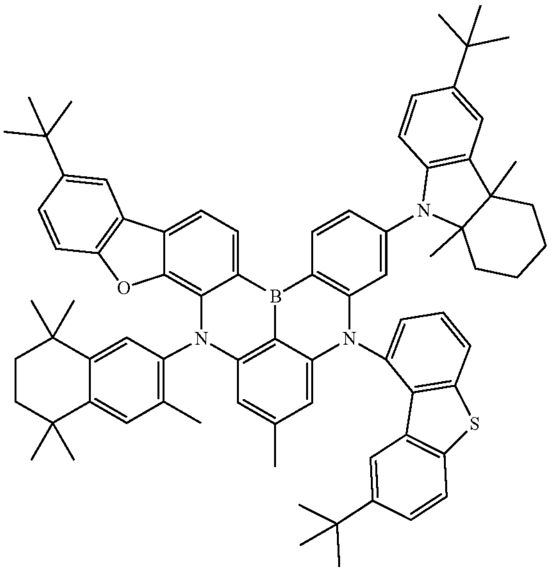

-continued
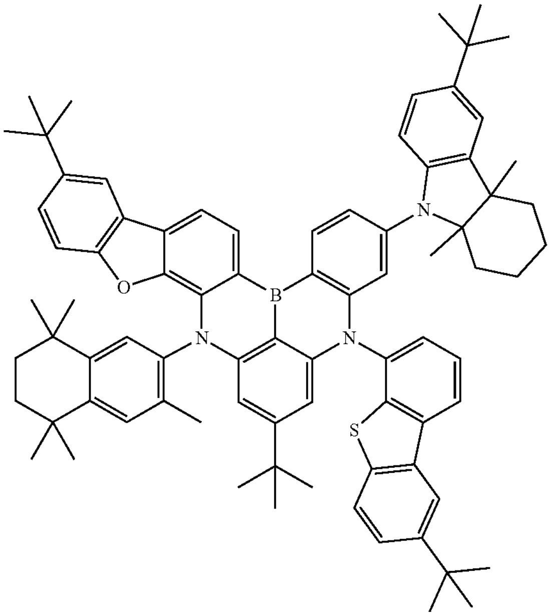
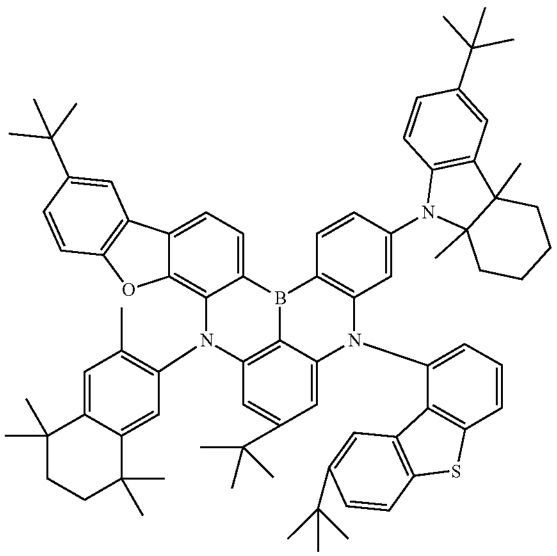
-continued
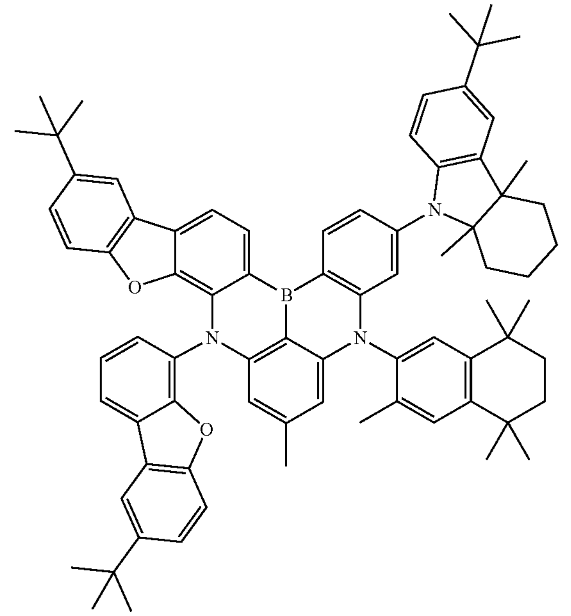
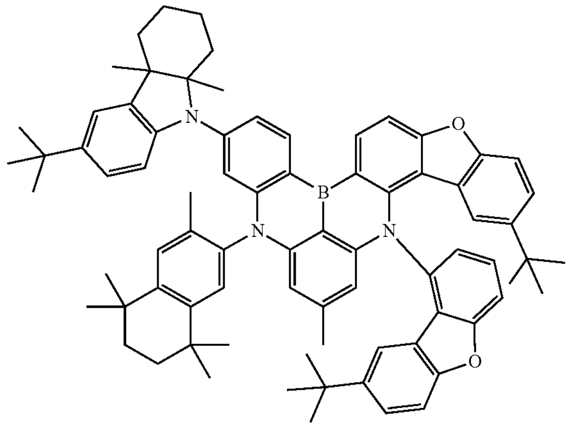
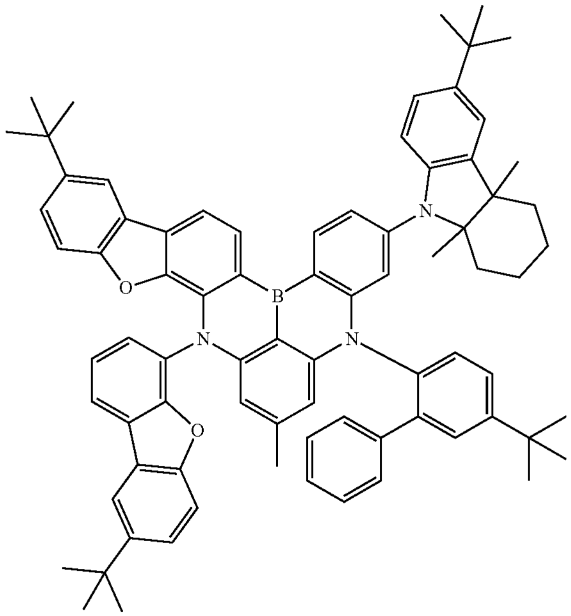

-continued
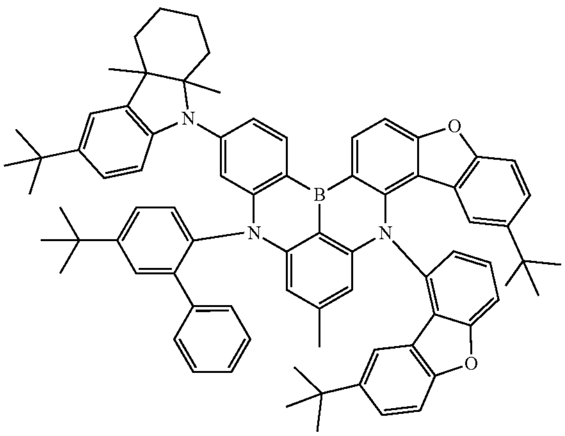
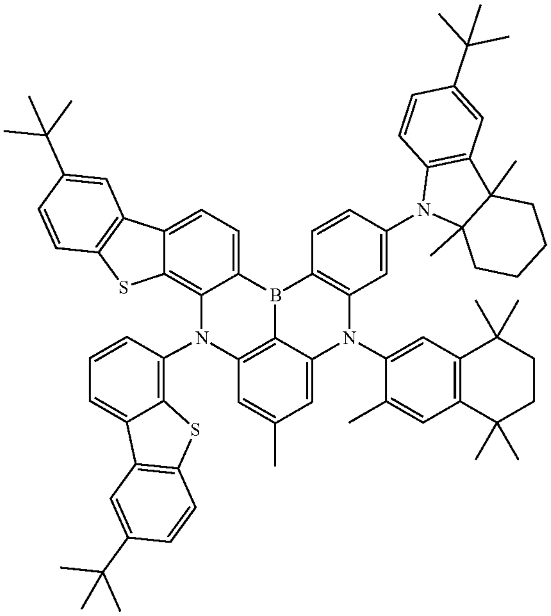
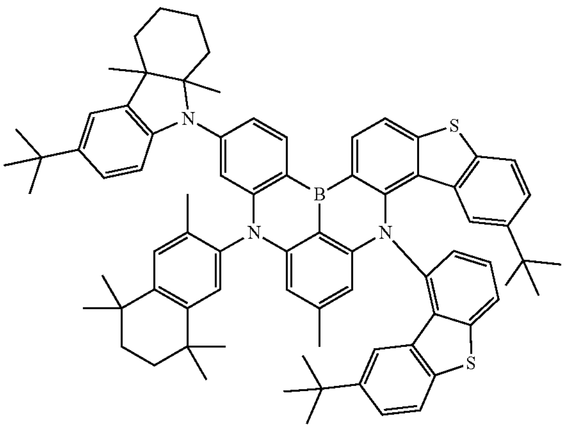
-continued
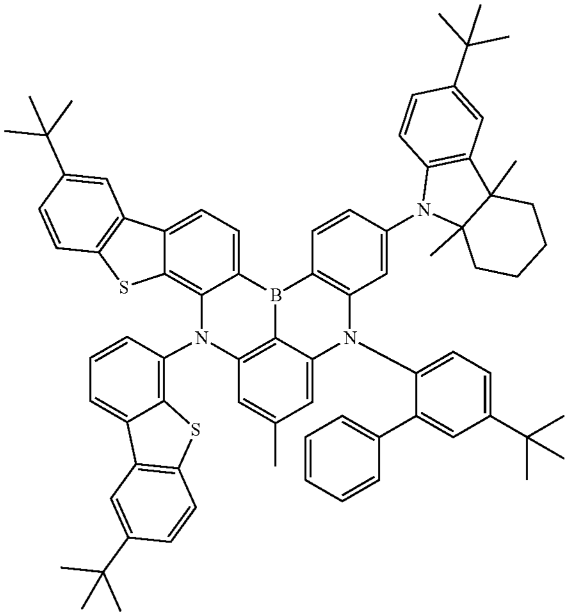
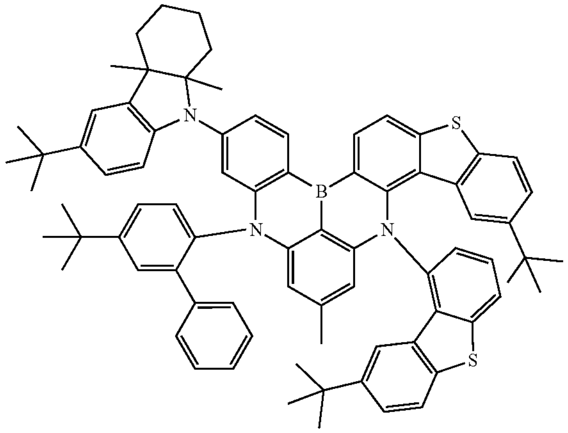
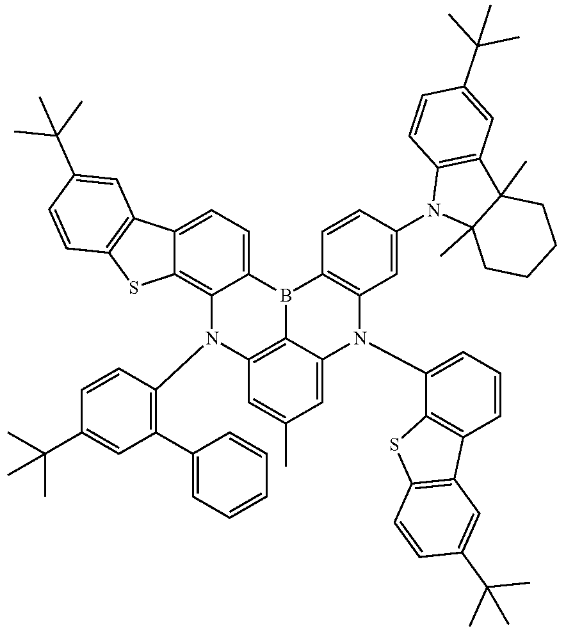

-continued
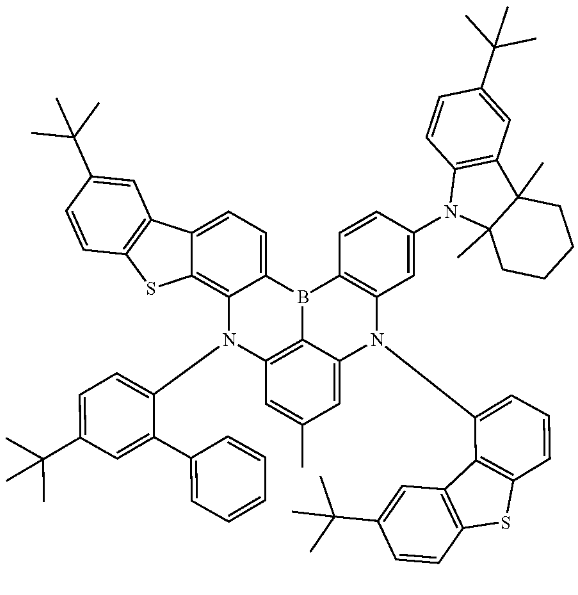
-continued
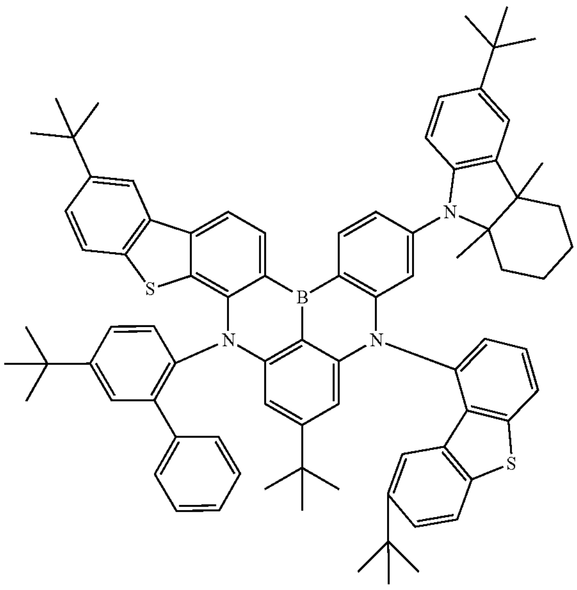
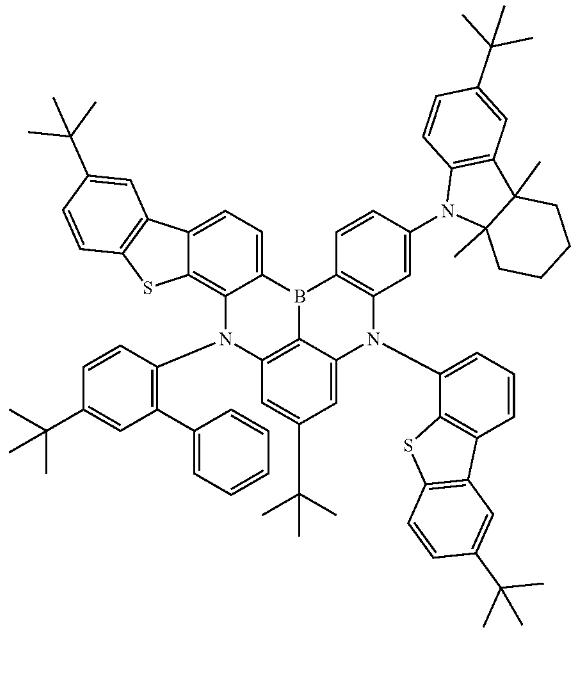
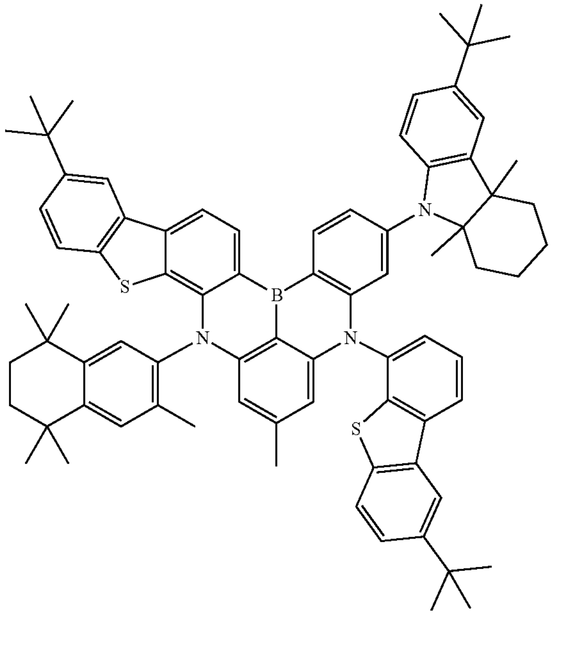

-continued
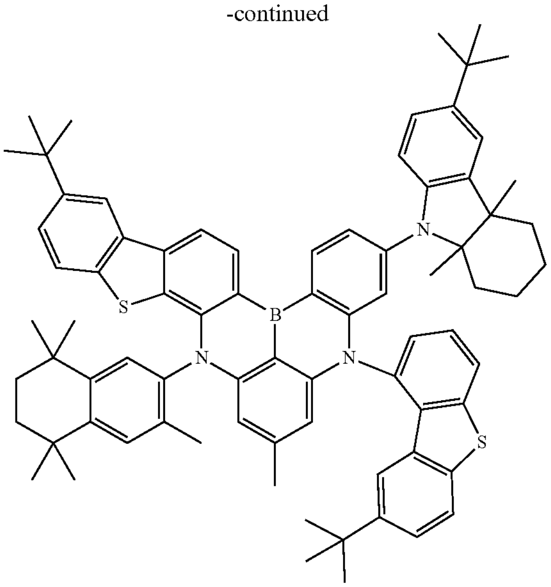
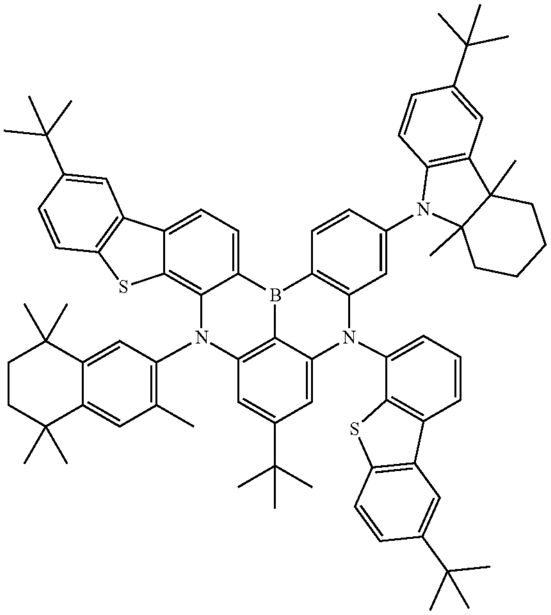
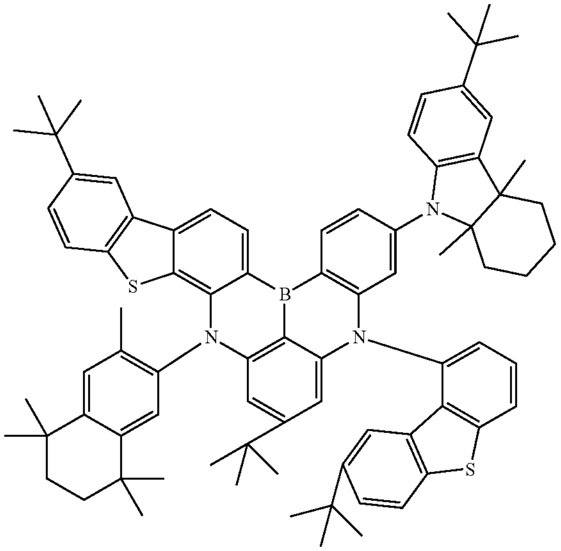
-continued
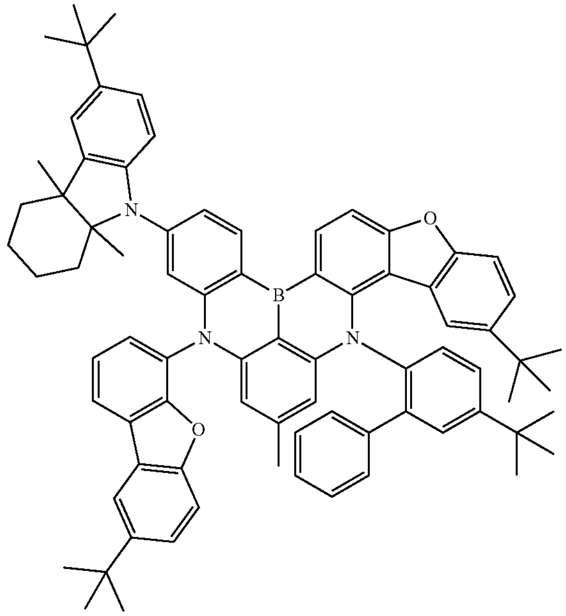
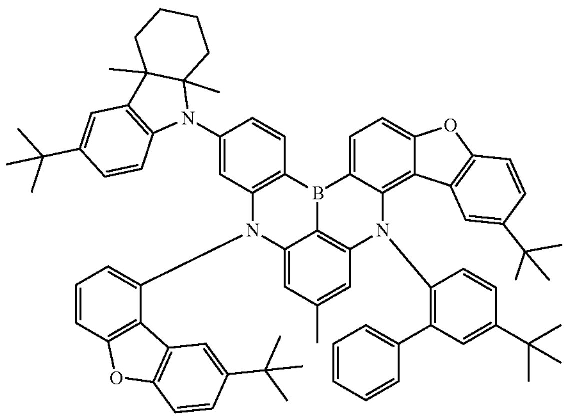
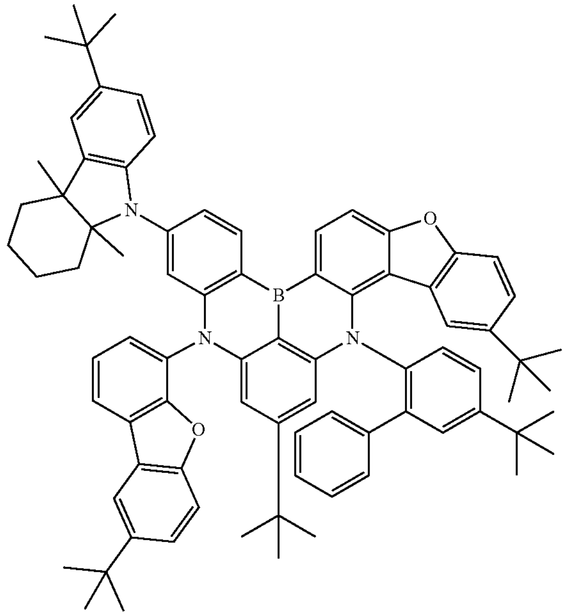

-continued
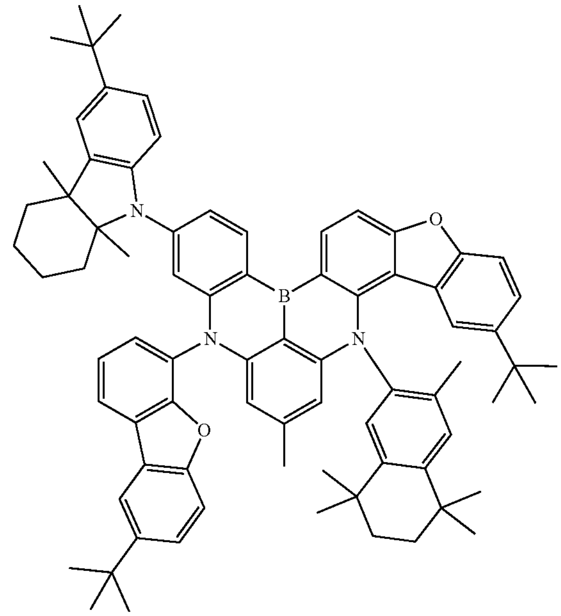
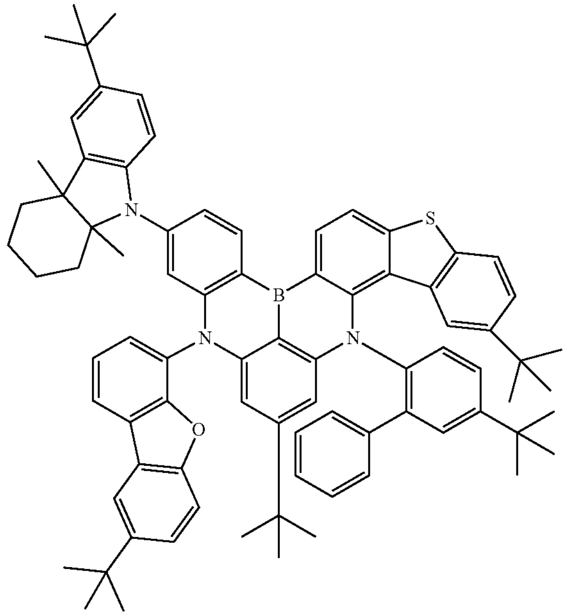
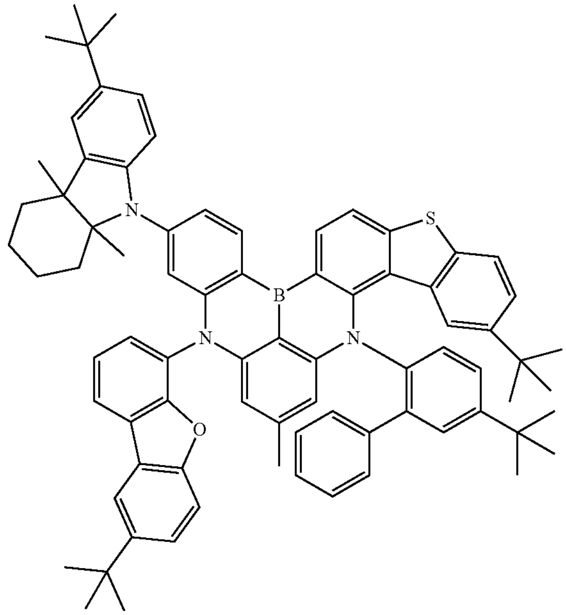
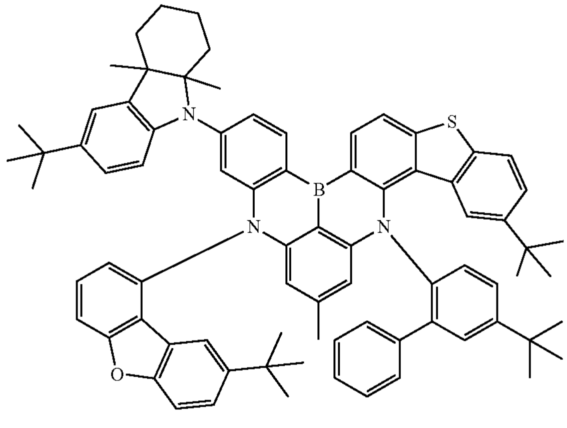
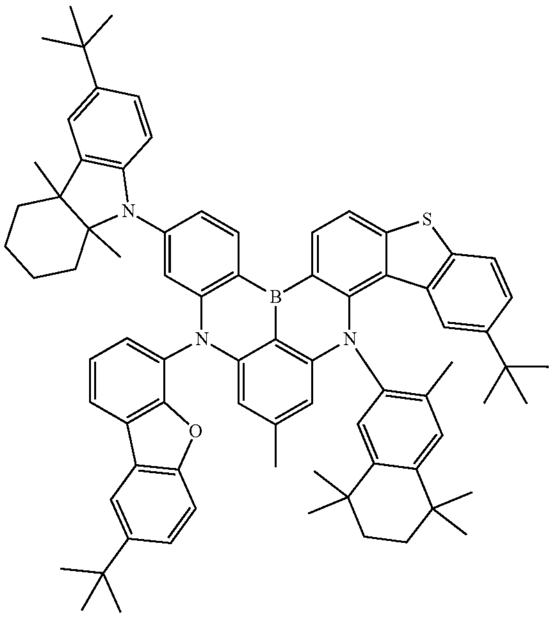
-continued -continued
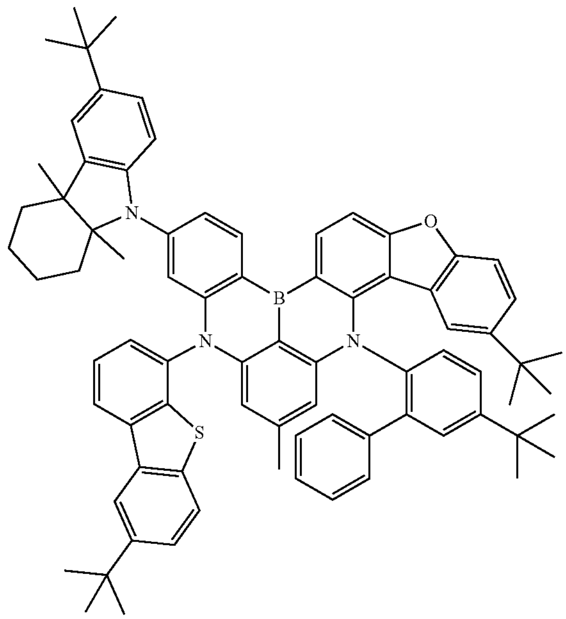
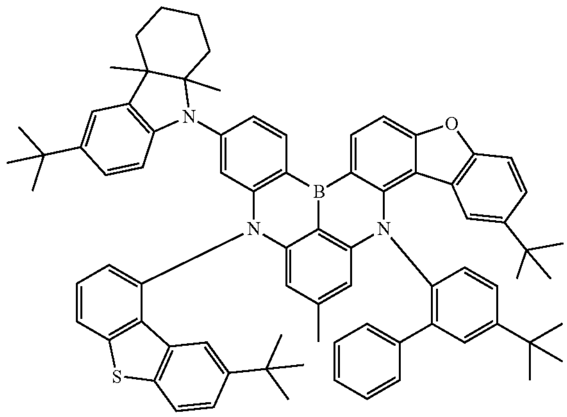
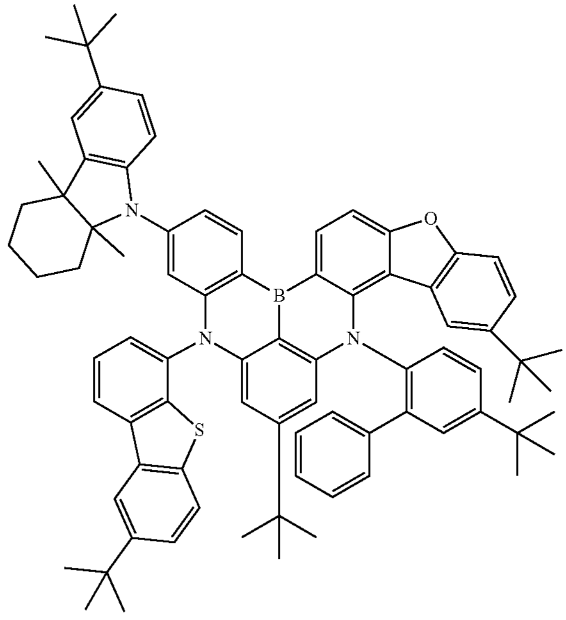
-continued
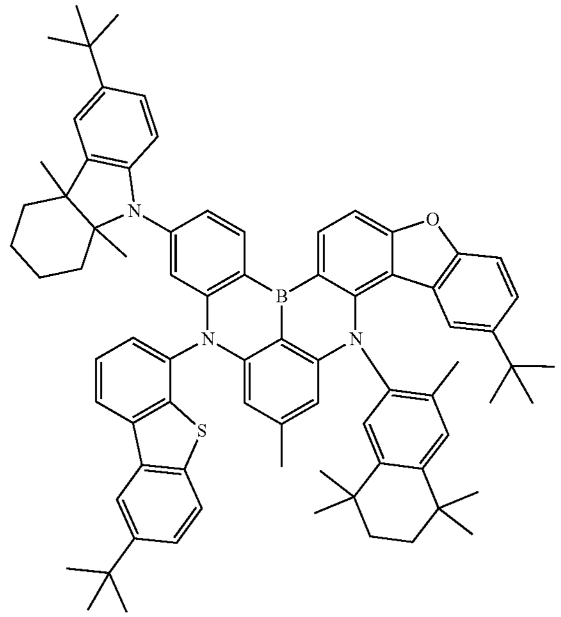
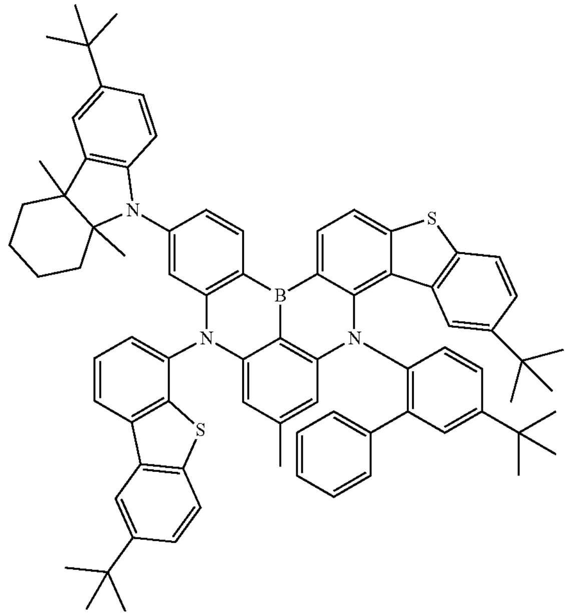
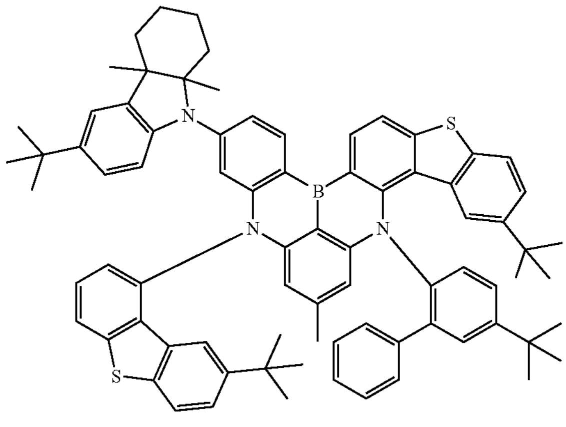

-continued
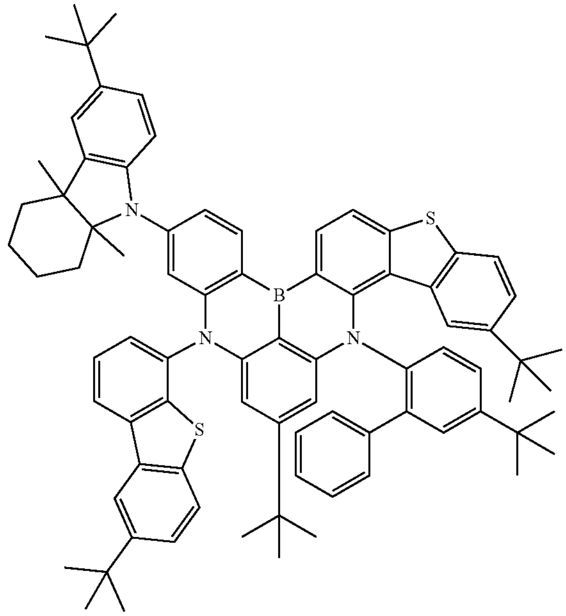
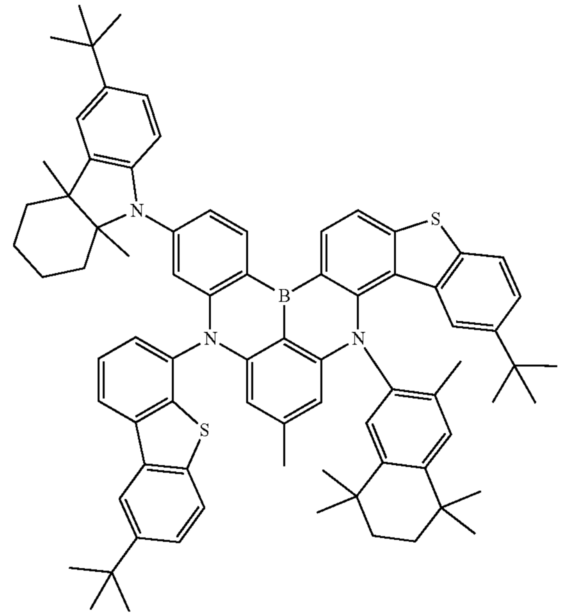
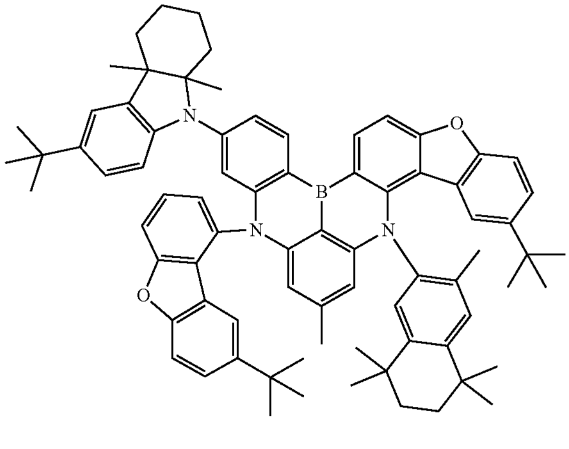
-continued
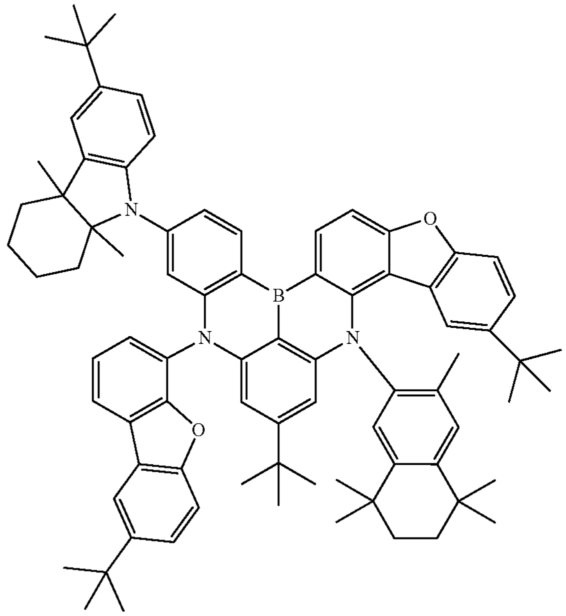
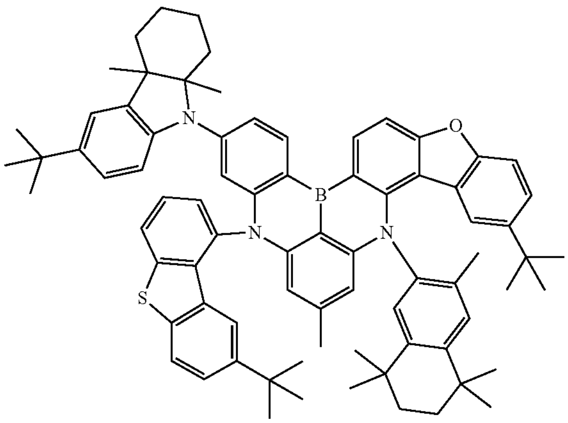
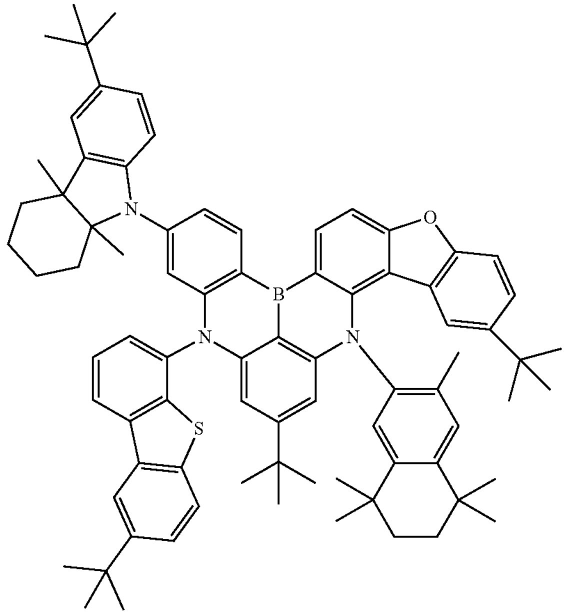

-continued

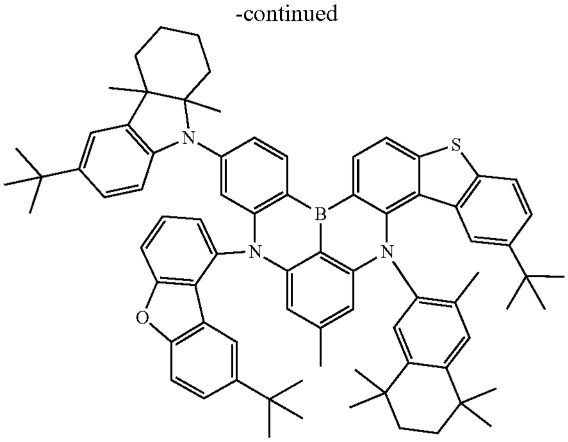

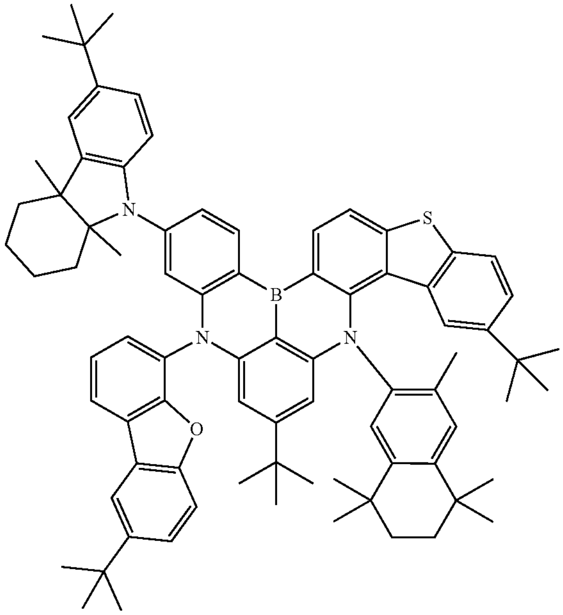

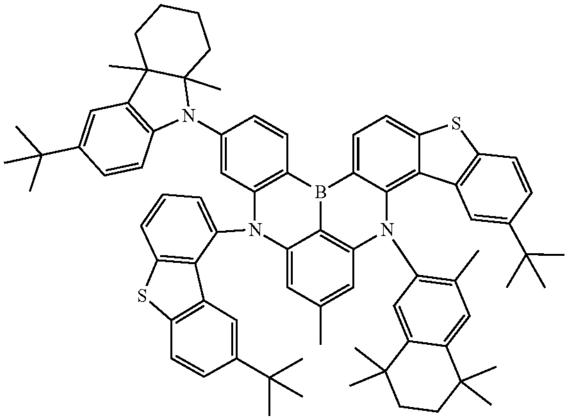

-continued

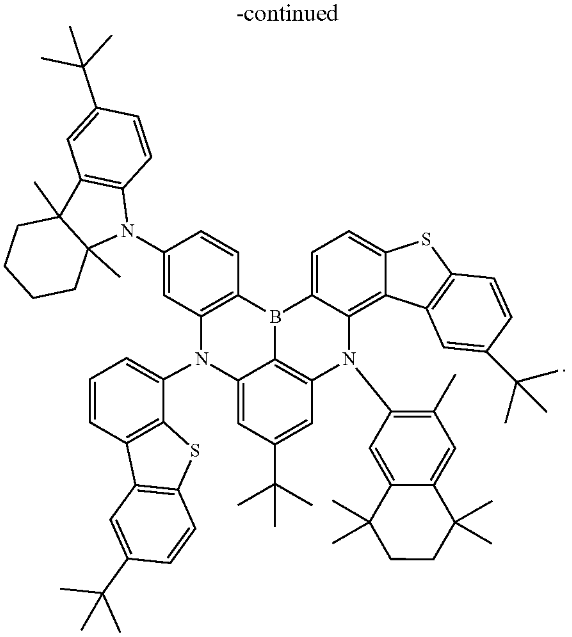

8. An organic light emitting device comprising:

a first electrode;

a second electrode; and an organic material layer having one or more layers provided between the first electrode and the second electrode, wherein one or more layers of the organic material layer comprise the compound according to claim 1.

9. The organic light emitting device of claim 8, wherein the organic material layer comprises a hole transport layer or a hole injection layer, and the hole transport layer or the hole injection layer comprises the compound.

10. The organic light emitting device of claim 8, wherein the organic material layer comprises an electron transport layer or an electron injection layer, and the electron transport layer or the electron injection layer comprises the compound.

11. The organic light emitting device of claim 8, wherein the organic material layer comprises a light emitting layer, and the light emitting layer comprises the compound.

12. The organic light emitting device of claim 8, wherein the organic material layer comprises a light emitting layer, and the light emitting layer comprises the compound as a dopant of the light emitting layer.

* * * * *